US006351190B1

(12) United States Patent
O'Toole et al.

(10) Patent No.: US 6,351,190 B1
(45) Date of Patent: *Feb. 26, 2002

(54) STAGE HAVING CONTROLLED VARIABLE RESISTANCE LOAD CIRCUIT FOR USE IN VOLTAGE CONTROLLED RING OSCILLATOR

(75) Inventors: James E. O'Toole; John R. Tuttle; Mark E. Tuttle; Tyler Lowrey; Kevin M. Devereaux; George E. Pax; Brian P. Higgins; Shu-Sun Yu, all of Boise, ID (US); David K. Ovard, Meridian, ID (US); Robert R. Rotzoll, Chipita Park, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/568,085

(22) Filed: May 9, 2000

Related U.S. Application Data

(60) Continuation of application No. 09/153,014, filed on Sep. 14, 1998, which is a division of application No. 08/705,043, filed on Aug. 29, 1996, now Pat. No. 6,130,602.

(60) Provisional application No. 60/017,900, filed on May 13, 1996.

(51) Int. Cl.[7] .................................................. H03B 5/02

(52) U.S. Cl. ..................................... 331/57; 331/177 R

(58) Field of Search ................................ 331/57, 177 R

(56) References Cited

U.S. PATENT DOCUMENTS

| | | | |
|---|---|---|---|
| 3,299,424 A | 1/1967 | Vinding | 340/825.34 |
| 3,852,755 A | 12/1974 | Works et al. | 343/701 |
| 3,924,320 A | 12/1975 | Altman et al. | 29/578 |
| 4,075,632 A | 2/1978 | Baldwin et al. | 342/51 |
| 4,572,976 A | 2/1986 | Fockens | 307/524 |
| 4,656,463 A | 4/1987 | Anders et al. | 340/572 |
| 4,700,179 A | 10/1987 | Fancher | 340/572.2 |

(List continued on next page.)

OTHER PUBLICATIONS

*Analysis and Design of Analog Integrated Circuits*, Paul R. Gray & Robert G. Meyer, pp. 667–681, 1993. John Wiley & Sons, Inc. New York.

*Analog Integrated Circuits for Communication* (*Principles, Simulation and Design*), Donald O. Pederson & Kartikeya Mayaram, pp. 431–433, 1991. Kluwer Academic Publishers, Boston, 1996.

*A Precise Four–Quadrant Multiplier With Subnanosecond Response*, B. Gilbert, IEEE Journal of Solid State Circuits, pp. 365–373, 1968.

(List continued on next page.)

*Primary Examiner*—Siegfried H. Grimm
(74) *Attorney, Agent, or Firm*—Wells, St. John, Roberts, Gregory & Matkin, P.S.

(57) ABSTRACT

A stage for a voltage controlled oscillator includes a first p-channel transistor having a gate defining a control node, having a source adapted to be coupled to a supply voltage, and having a drain; a second p-channel transistor having a gate coupled to the control node, having a source coupled to the supply voltage, and having a drain; a first n-channel transistor having a gate defining a first input, having a drain coupled to the drain of the first p-channel transistor and defining a first node, and having a source; a second n-channel transistor having a gate defining a second input, having a drain coupled to the drain of the second p-channel transistor and defining a second node, and having a source; a current draw; first and second loads; a first source follower having an input coupled to the first node; and a second source follower.

17 Claims, 3273 Drawing Sheets

Microfiche Appendix Included
(5 Microfiche, 266 Pages)

U.S. PATENT DOCUMENTS 4,724,427 A 2/1988 Carroll ....................... 340/572
4,743,864 A 5/1988 Nakagawa et al. ..... 455/343 X
4,746,830 A 5/1988 Holland ...................... 310/313
4,786,903 A 11/1988 Grindahl et al. ....... 340/825.54
4,800,543 A 1/1989 Lyndon-James et al. ...... 368/10
4,816,839 A 3/1989 Landt ......................... 343/795
4,827,395 A 5/1989 Anders et al. ................ 700/9
4,853,705 A 8/1989 Landt ......................... 343/803
4,854,328 A 8/1989 Pollack ....................... 128/736
4,857,893 A 8/1989 Carroll ....................... 340/572
4,862,160 A 8/1989 Ekchian et al. ........ 340/825.54
4,870,419 A 9/1989 Baldwin et al. .............. 342/50
4,888,591 A 12/1989 Landt et al. .................. 342/44
4,890,072 A 12/1989 Espe et al. .................... 331/11
4,912,471 A 3/1990 Tyburski et al. .............. 342/42
4,926,182 A 5/1990 Ohta et al. .................... 342/44
4,952,889 A 8/1990 Irwin et al. ................. 332/128
5,030,807 A 7/1991 Landt et al. ................ 235/375
5,075,691 A 12/1991 Garay et al. ................ 343/830
5,081,458 A 1/1992 Meunier ...................... 342/44
5,086,389 A 2/1992 Hassett et al. .............. 364/401
5,412,665 A 5/1992 Gruodis et al. ............. 714/739
5,122,687 A 6/1992 Schmidt et al. ............. 307/471
5,128,938 A 7/1992 Borras .................... 455/343 X
5,130,668 A 7/1992 Emslie et al. ............... 330/281
5,134,085 A 7/1992 Gilgen et al. ................. 437/52
5,142,292 A 8/1992 Chang ........................ 343/742
5,144,314 A 9/1992 Malmberg et al. ............ 342/44
5,153,583 A 10/1992 Murdoch ............... 340/825.54
5,164,985 A 11/1992 Nysen et al. .................. 380/9
5,175,774 A 12/1992 Truax et al. ................... 382/8
5,191,295 A 3/1993 Necoechea .................. 328/155
5,206,609 A 4/1993 Mijuskovic .................. 331/57
5,218,343 A 6/1993 Stobbe et al. ............... 340/572
5,231,273 A 7/1993 Caswel ....................... 235/385
5,252,979 A 10/1993 Nysen ......................... 342/50
5,272,367 A 12/1993 Dennison et al. ........... 257/306
5,281,927 A 1/1994 Parker ........................ 331/1 A
5,287,112 A 2/1994 Schuermann ................ 342/42
5,294,928 A 3/1994 Cooper et al. .............. 341/142
5,300,875 A 4/1994 Tuttle .......................... 320/20
5,311,186 A 5/1994 Utsu et al. .................... 342/51
5,323,150 A 6/1994 Tuttle .................... 340/825.54
5,340,968 A 8/1994 Watanabe et al. ........... 235/380
5,355,513 A 10/1994 Clarke et al. ................. 455/20
5,365,551 A 11/1994 Snodgrass et al. ............. 375/1
5,374,930 A 12/1994 Schuermann ................ 342/42
5,394,444 A 2/1995 Silvey et al. ............... 327/156
5,406,263 A 4/1995 Tuttle ......................... 340/572
5,412,351 A 5/1995 Nystrom et al. ............ 332/103
5,416,434 A 5/1995 Koostra et al. ............. 327/113
5,420,757 A 5/1995 Eberhardt et al. .......... 361/813
5,430,441 A 7/1995 Bickley et al. ........ 340/825.54
5,444,223 A 8/1995 Blama ........................ 235/435
5,446,761 A 8/1995 Nag et al. ................... 375/317
5,448,110 A 9/1995 Tuttle et al. ................ 257/723
5,448,242 A 9/1995 Sharpe et al. ................. 342/42
5,448,772 A 9/1995 Grandfield .................. 455/333
5,450,087 A 9/1995 Hurta et al. .................. 342/42
5,461,385 A 10/1995 Armstrong ................... 342/42
5,471,212 A 11/1995 Sharpe et al. ................. 342/51
5,478,991 A 12/1995 Watanabe et al. ........... 235/375
5,489,546 A 2/1996 Ahmad et al. ................ 437/57
5,499,214 A 3/1996 Mori et al. ................ 365/222
5,500,650 A 3/1996 Snodgrass et al. ............ 342/42
5,525,992 A 6/1996 Froschermeier .............. 342/42
5,541,583 A 7/1996 Mandelbaum ......... 340/825.54
5,541,585 A 7/1996 Duhame et al. ....... 340/825.69
5,568,512 A 10/1996 Rotzoll ....................... 375/211
5,576,647 A 11/1996 Sutardja et al. ............. 327/108
5,606,323 A 2/1997 Heinrich et al. .............. 342/51
5,621,412 A 4/1997 Sharpe et al. ................. 342/51
5,623,224 A 4/1997 Yamada et al. ............. 327/333
5,649,296 A 7/1997 MacLellan et al. ........ 455/38.2
5,657,359 A 8/1997 Sakae et al. ................ 327/157
5,677,667 A 10/1997 Lesesky et al. ............. 340/431
5,686,864 A 11/1997 Martin et al. ............... 327/159
5,686,920 A 11/1997 Hurta et al. .................. 342/42
5,703,509 A 12/1997 Hirata ........................ 327/119
5,719,550 A 2/1998 Bloch et al. ................ 340/426
5,721,678 A 2/1998 Widl ..................... 364/424.04
5,721,783 A 2/1998 Anderson .................. 381/68.6
5,726,630 A 3/1998 Marsh et al. ............... 340/572
5,774,022 A 6/1998 Griffin et al. ............... 331/1 A
5,780,916 A 7/1998 Berger et al. ............... 257/471
5,815,042 A 9/1998 Chow et al. .................. 331/57
5,901,349 A 5/1999 Guegnaud et al. .......... 455/302
5,907,789 A 5/1999 Komatsu .................... 438/649

OTHER PUBLICATIONS

"Micron Morning Report", The Idaho Statesman, Jul. 16, 1993.

"A Low–Power Spread Spectrum CMOS RFIC for Radio Identification Applications", by John R. Tuttle, Conference Proceedings from RF Expo West, pp. 216–222, Mar. 22–24, 1994, San Jose, CA.

"CMOS Analog Integrated Circuits Based on Weak Inversion Operation", by Eric Vittoz and Jean Fellrath, IEEE Journal of Solid State Circuits, vol. SC–12, No. 3, Jun. 1977.

"Digital RF/ID Enhances GPS", by John R. Tuttle, Proceedings of the Second Annual Wireless Symposium, pp. 406–411, Feb. 15–18, 1994, Santa Clara, CA.

"Micro RFID Communications Protocol Manual," Jul. 22, 1993, Pre–Release Version 0.95, pp. 1–71.

Waugh, Raymond; "Designing Detectors for RF/ID Tags"; Expo West Conference, Jan. 29–Feb. 1, 1995; pp. 1–12.

Muller & Kamins, DEVICE ELECTRONICS FOR INTEGRATED CIRCUITS, 1977, John Wiley & Sons, 2nd Edition, pp.157–160.

Fink & Christiansen, ELECTRONICS ENGINEER'S HANDBOOK, 1989, McGraw–Hill Book Company, 3rd Edition, pp. 7–41 to 7–42, 8–38 to 8–39, and 9–66 to 6–69.

| | | | | | | | | | | |
|---|---|---|---|---|---|---|---|---|---|---|
| 6AA | 6AB | 6AC | 6AD | 6AE | 6AF | 6AG | 6AH | 6AI | 6AJ | 6AK |
| 6BA | 6BB | 6BC | 6BD | 6BE | 6BF | 6BG | 6BH | 6BI | 6BJ | 6BK |
| 6CA | 6CB | 6CC | 6CD | 6CE | 6CF | 6CG | 6CH | 6CI | 6CJ | 6CK |
| 6DA | 6DB | 6DC | 6DD | 6DE | 6DF | 6DG | 6DH | 6DI | 6DJ | 6DK |
| 6EA | 6EB | 6EC | 6ED | 6EE | 6EF | 6EG | 6EH | 6EI | 6EJ | 6EK |

Fig. 6

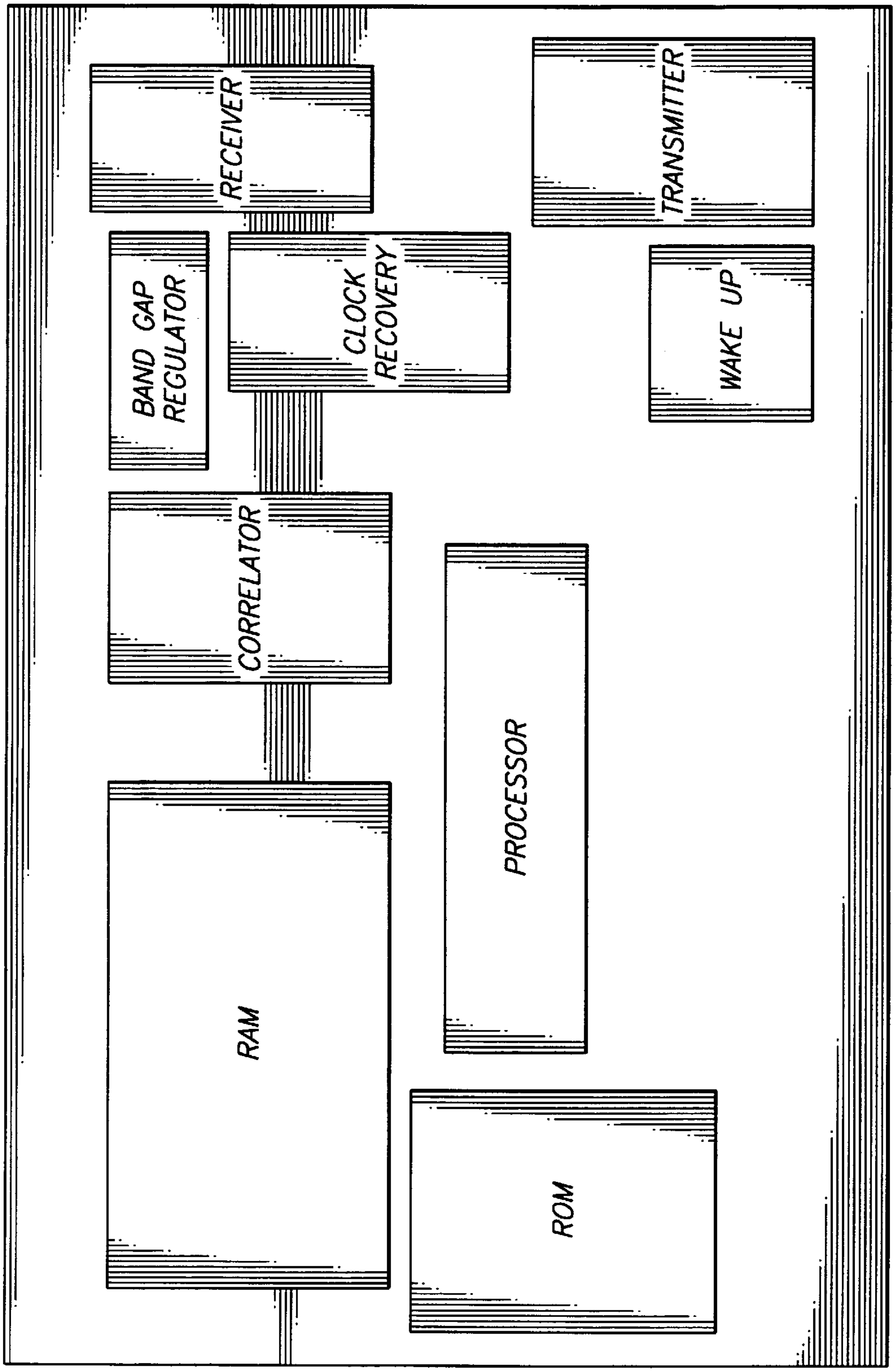
Fig. 6.01

| | | | | | | | | | |
|---|---|---|---|---|---|---|---|---|---|
| 7AA | 7AB | | | | | | | | |
| 7BA | 7BB | 7BC | 7BD | 7BE | 7BF | 7BG | 7BH | 7BI | 7BJ |
| 7CA | 7CB | 7CC | 7CD | 7CE | 7CF | 7CG | 7CH | 7CI | 7CJ |
| 7DA | 7DB | 7DC | 7DD | 7DE | 7DF | 7DG | 7DH | 7DI | 7DJ |
| 7EA | 7EB | 7EC | 7ED | 7EE | 7EF | 7EG | 7EH | 7EI | 7EJ |
| 7FA | 7FB | 7FC | 7FD | 7FE | 7FF | 7FG | 7FH | 7FI | 7FJ |
| | | | 7GD | 7GE | 7GF | 7GG | 7GH | 7GI | 7GJ |
| | | | 7HD | 7HE | 7HF | 7HG | 7HH | 7HI | 7HJ |

FIG. 7

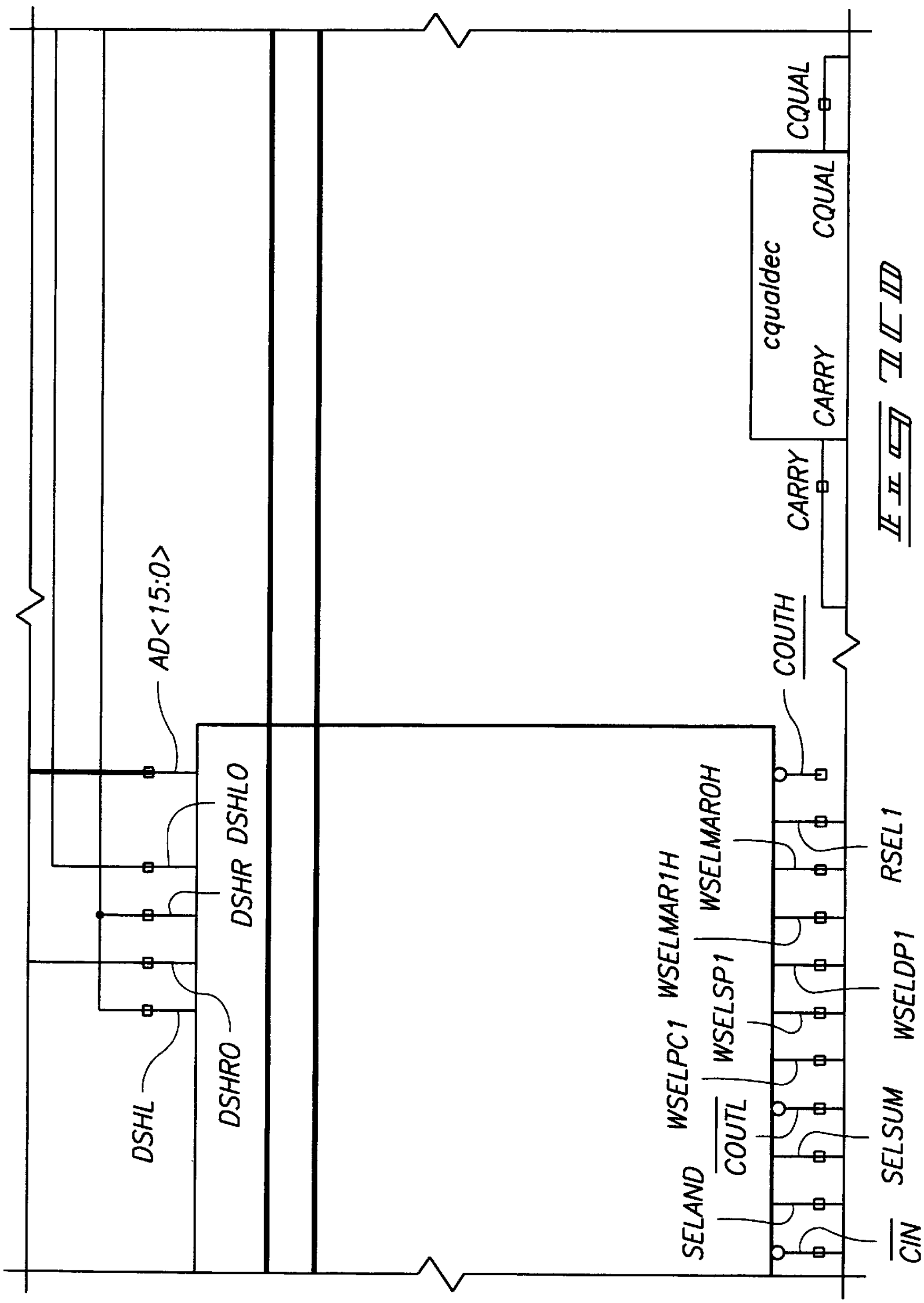
FIG. 7CIII

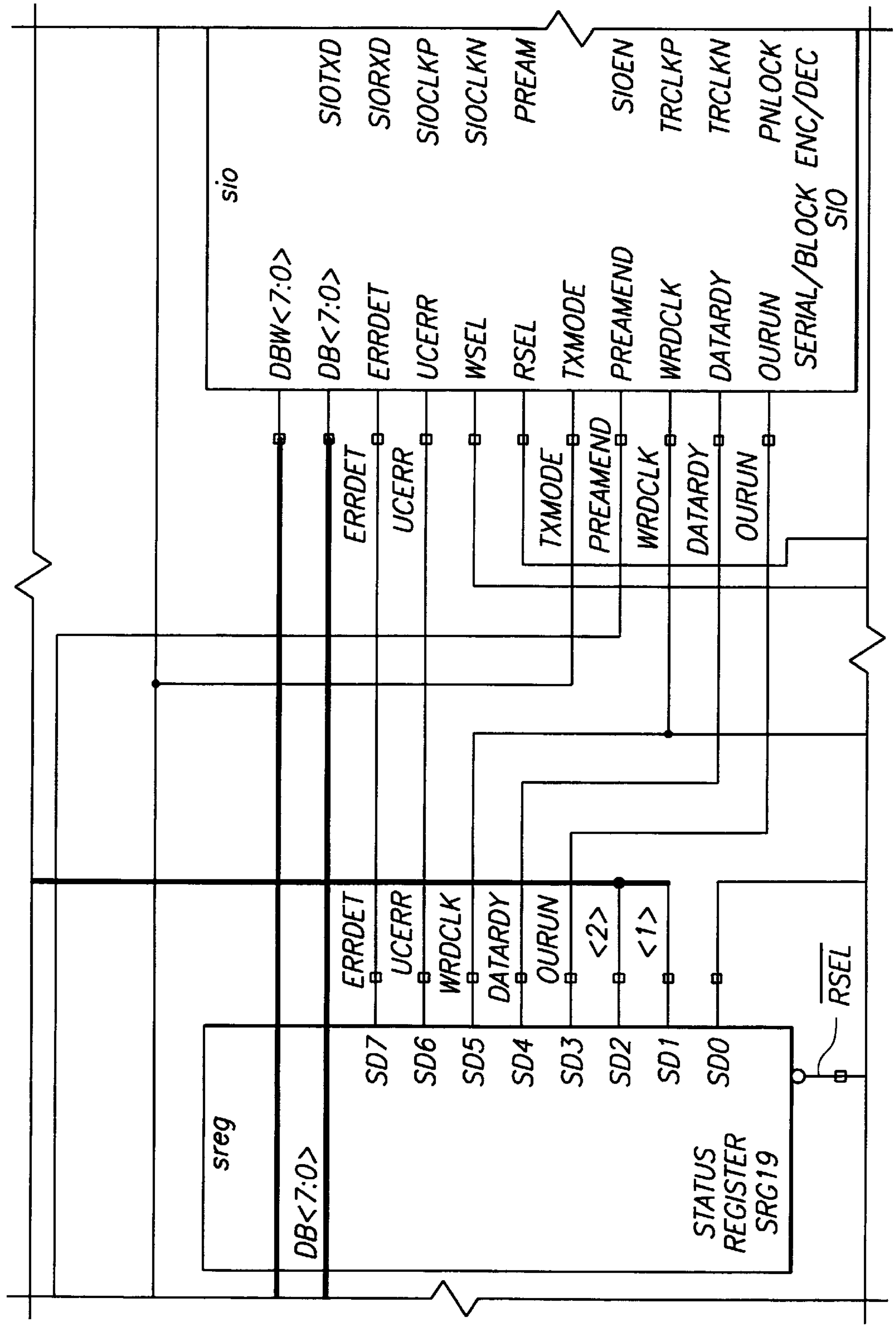
FIG. 7L1

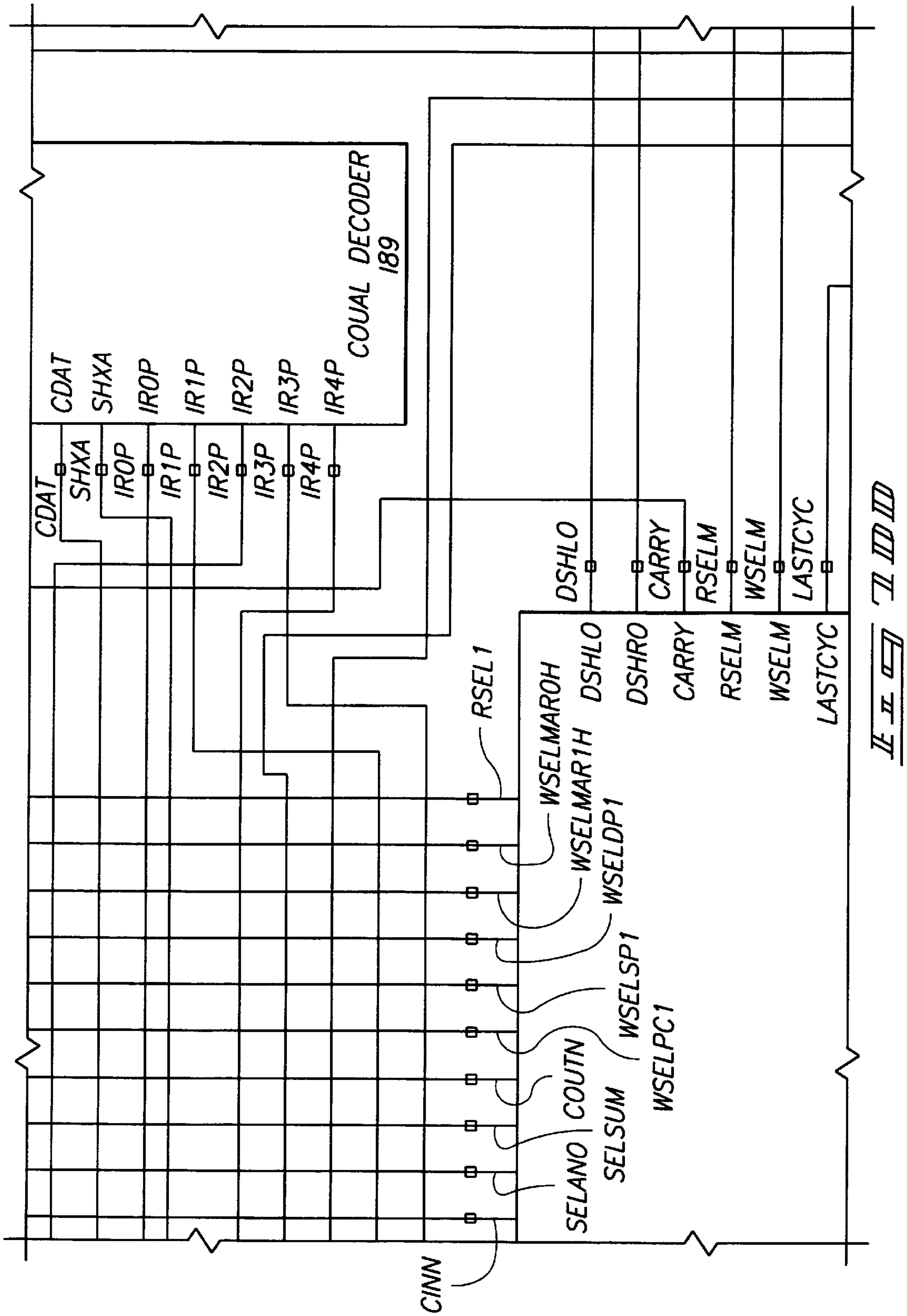
FIG. 7DDD

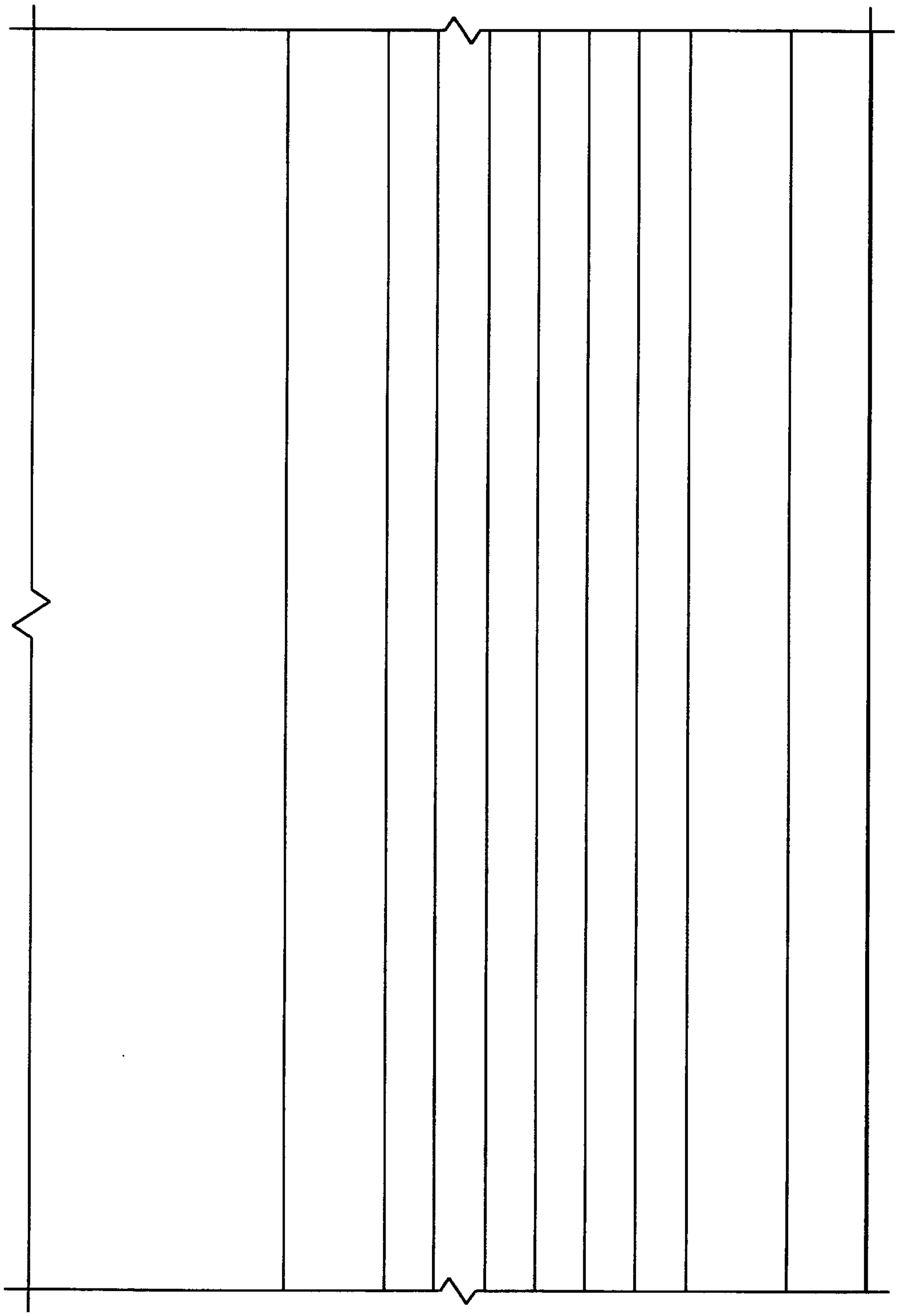
FIG. 7AFC

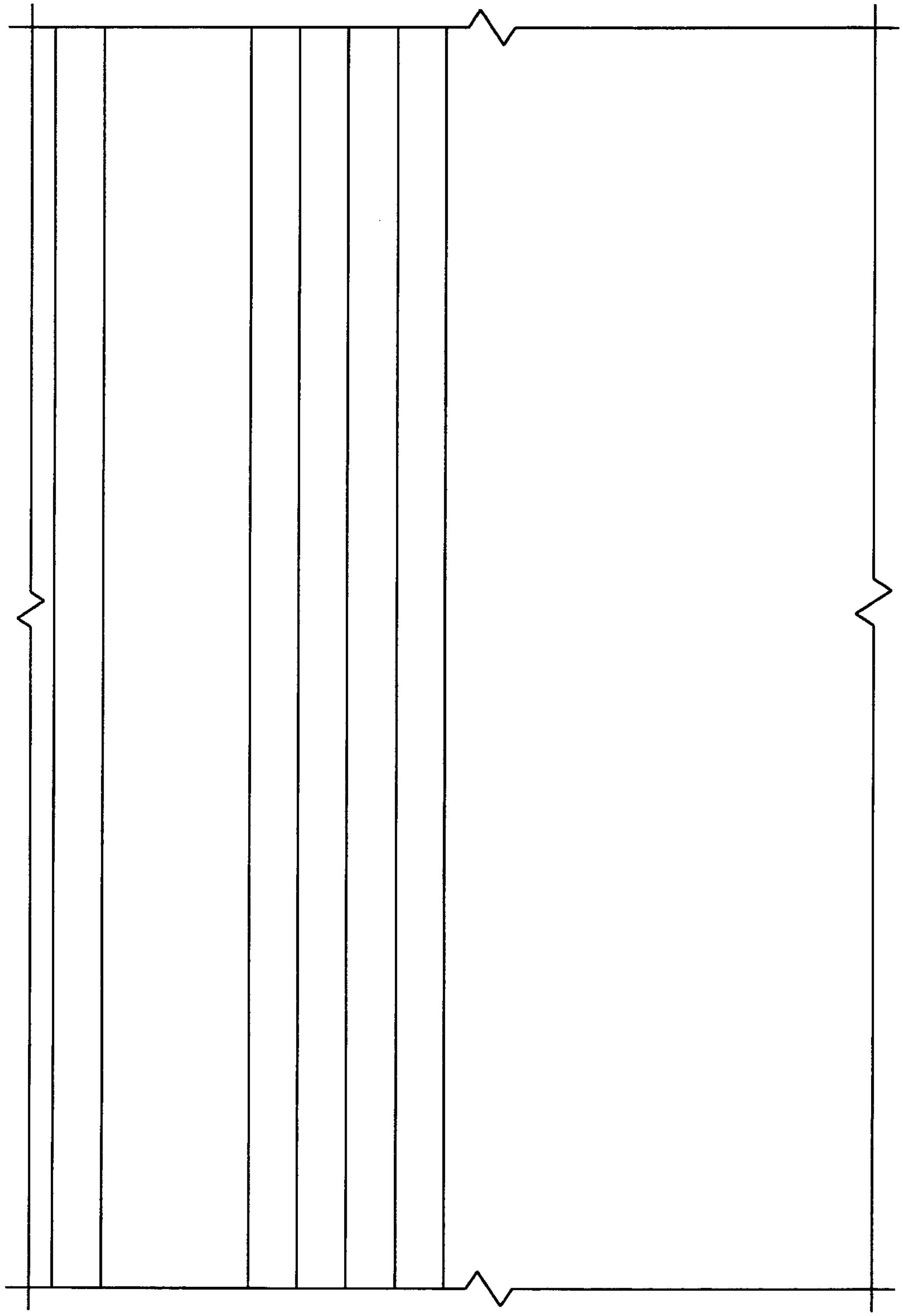
Fig. 7G1

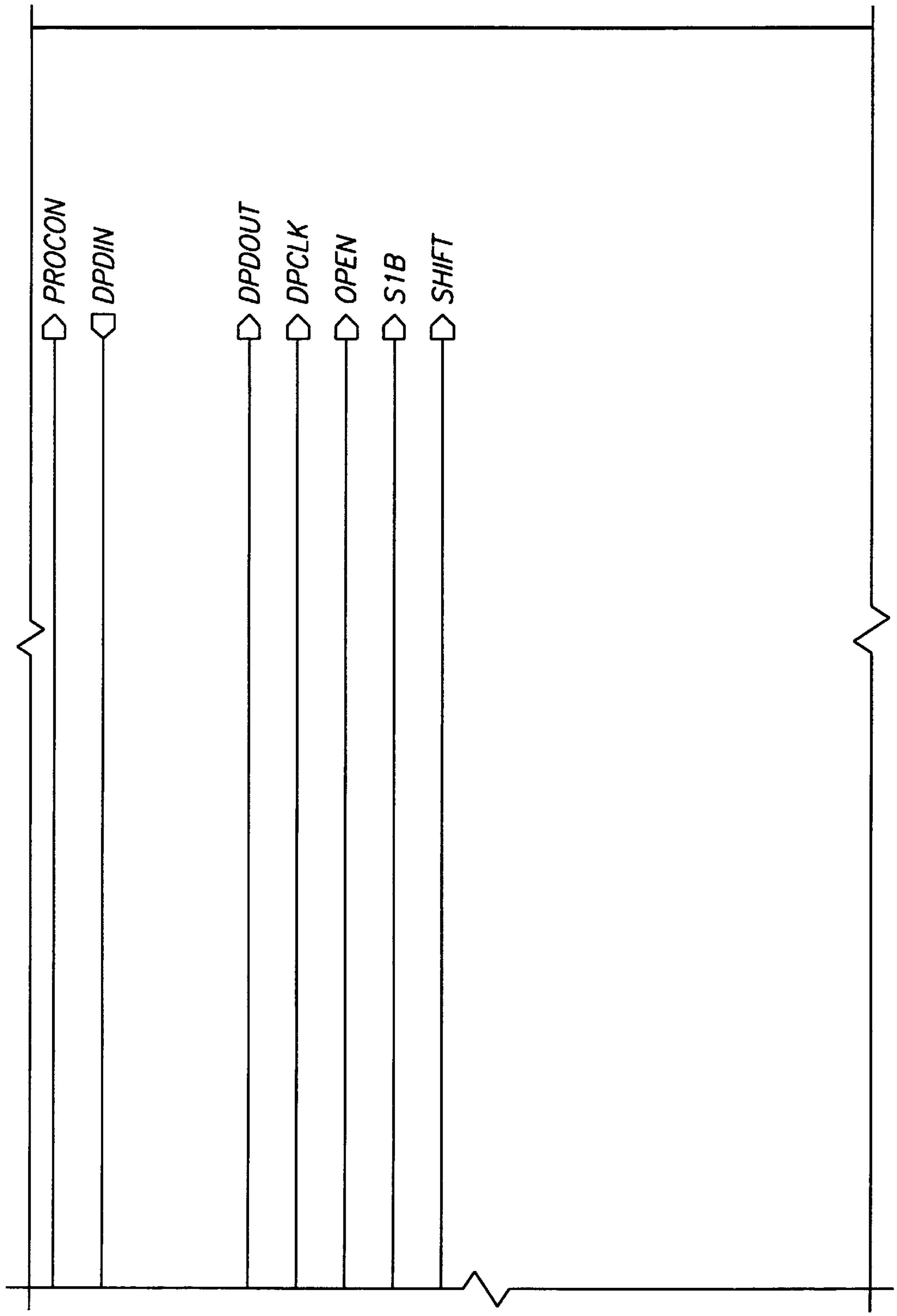
PROCON
DPDIN
DPDOUT
DPCLK
OPEN
S1B
SHIFT

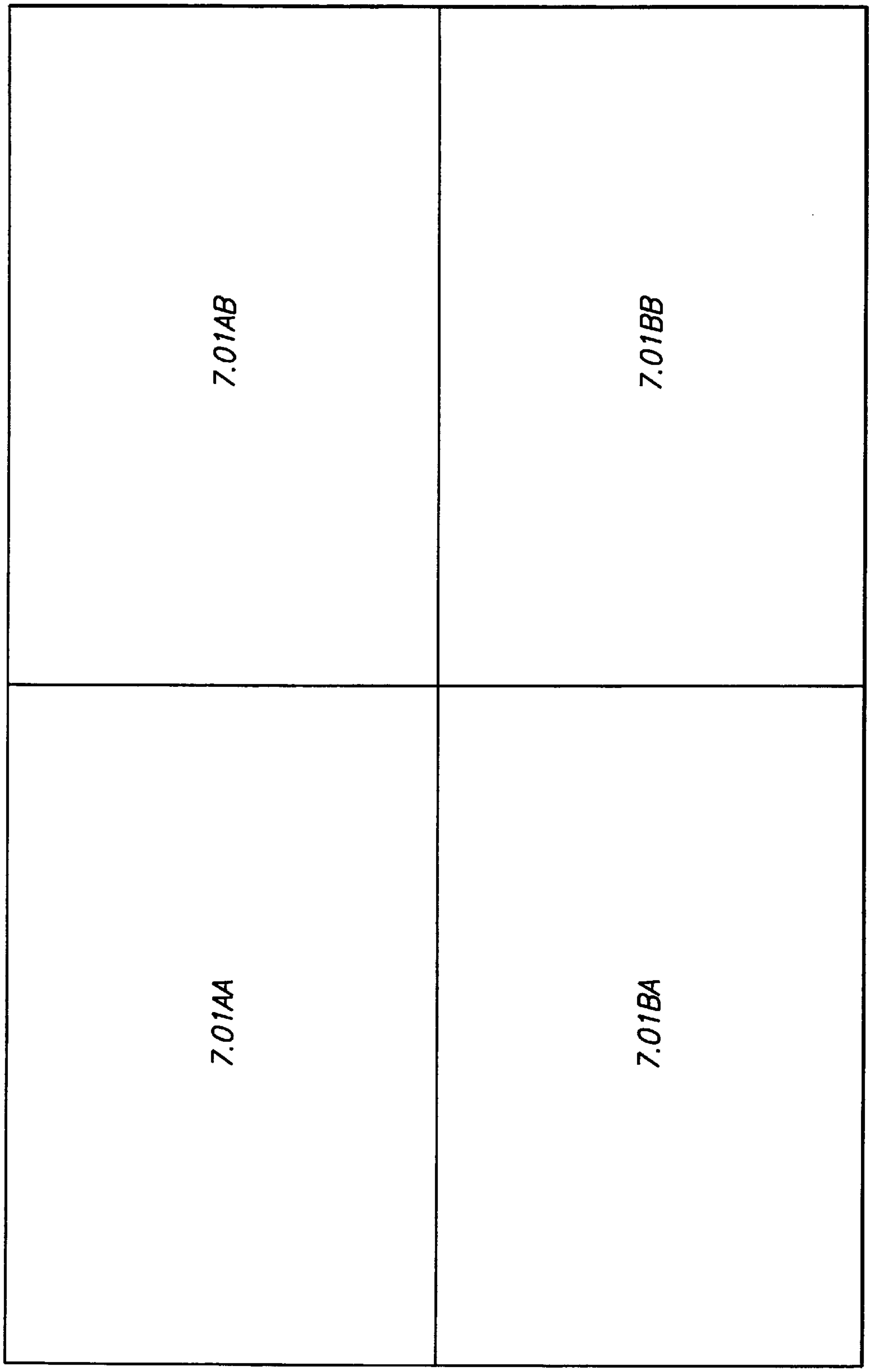
FIG. 7.01

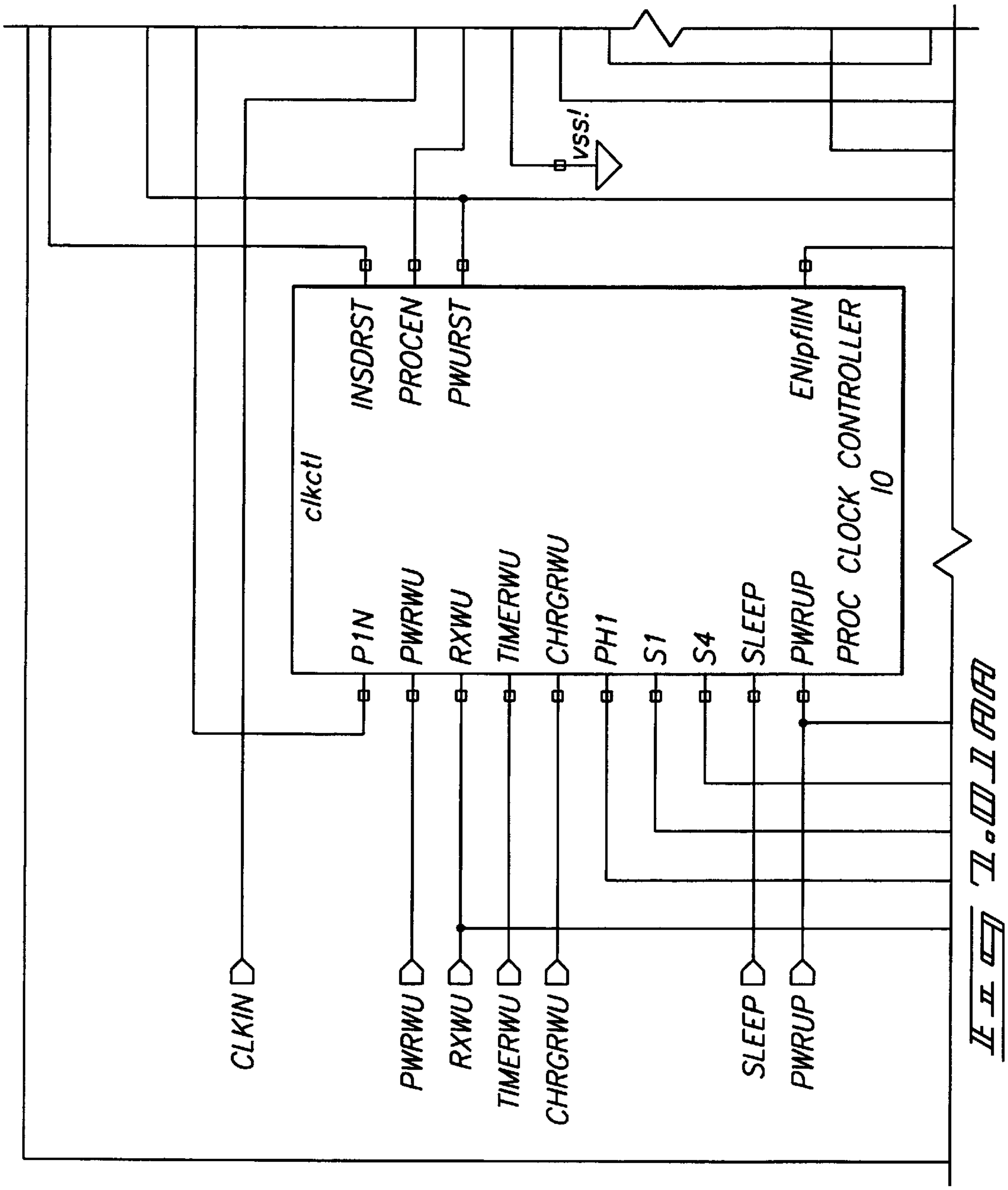
FIG. 7.01AA

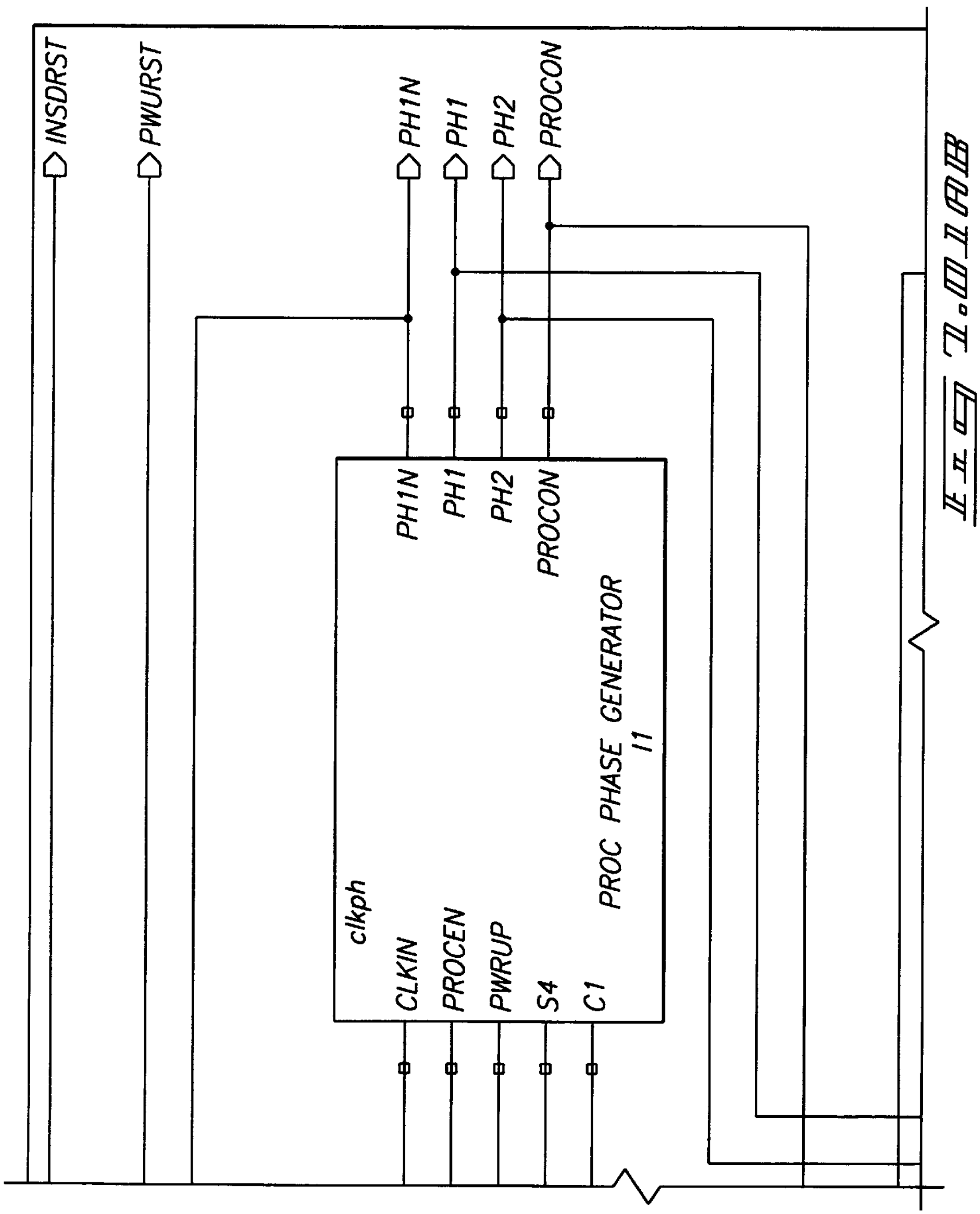
Fig. 7.01AB

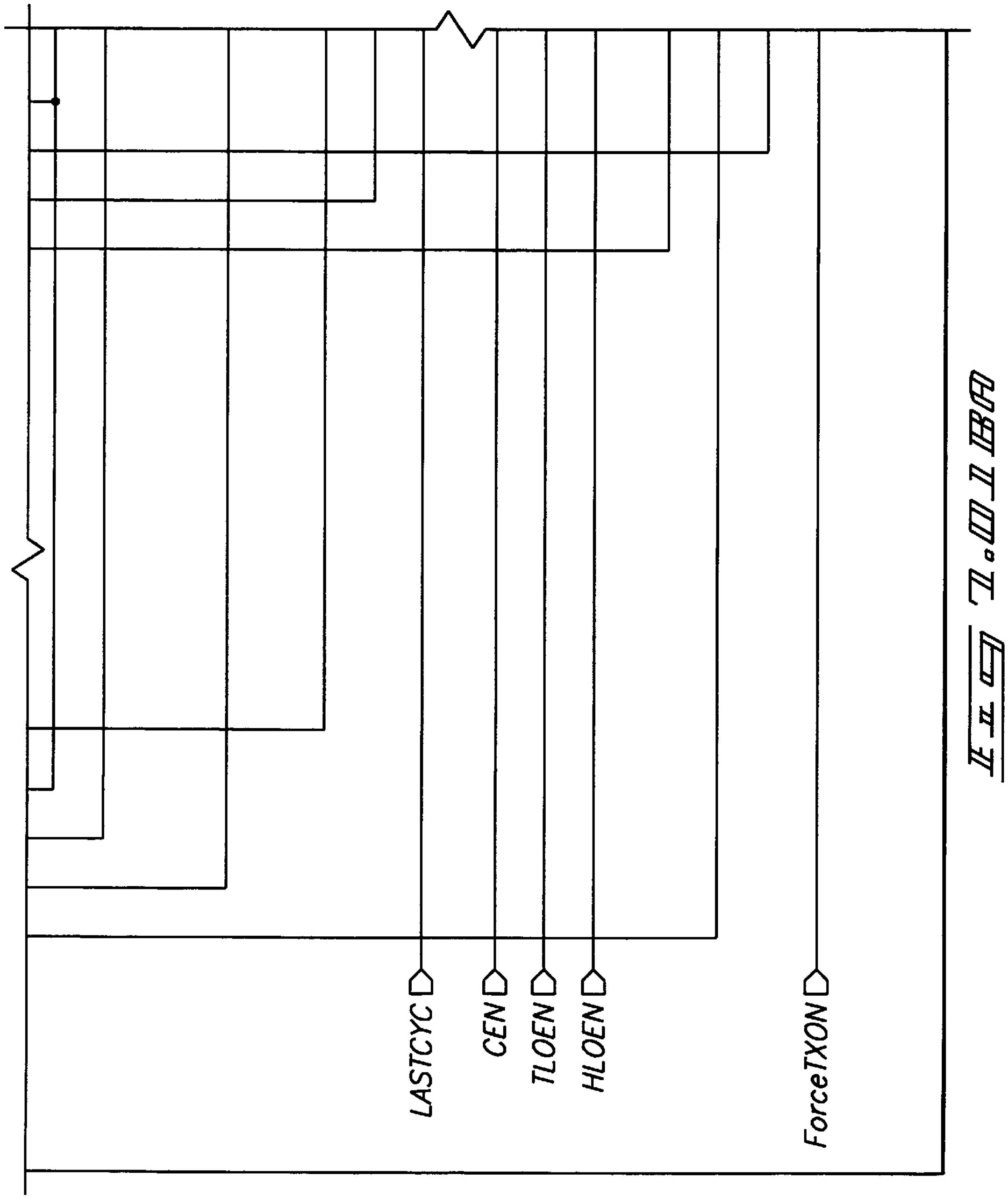
FIG. 7.01BA

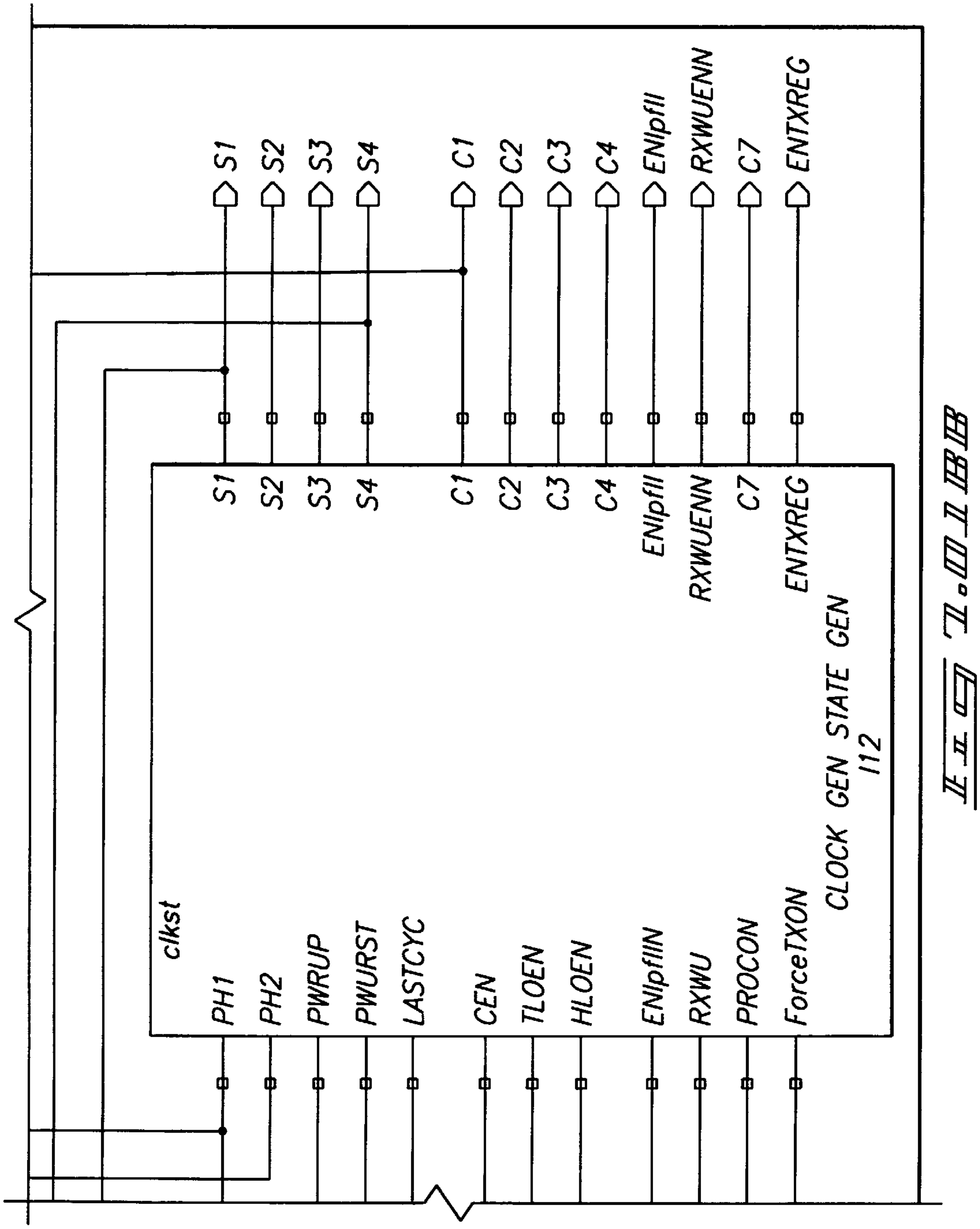
FIG. 7.01B

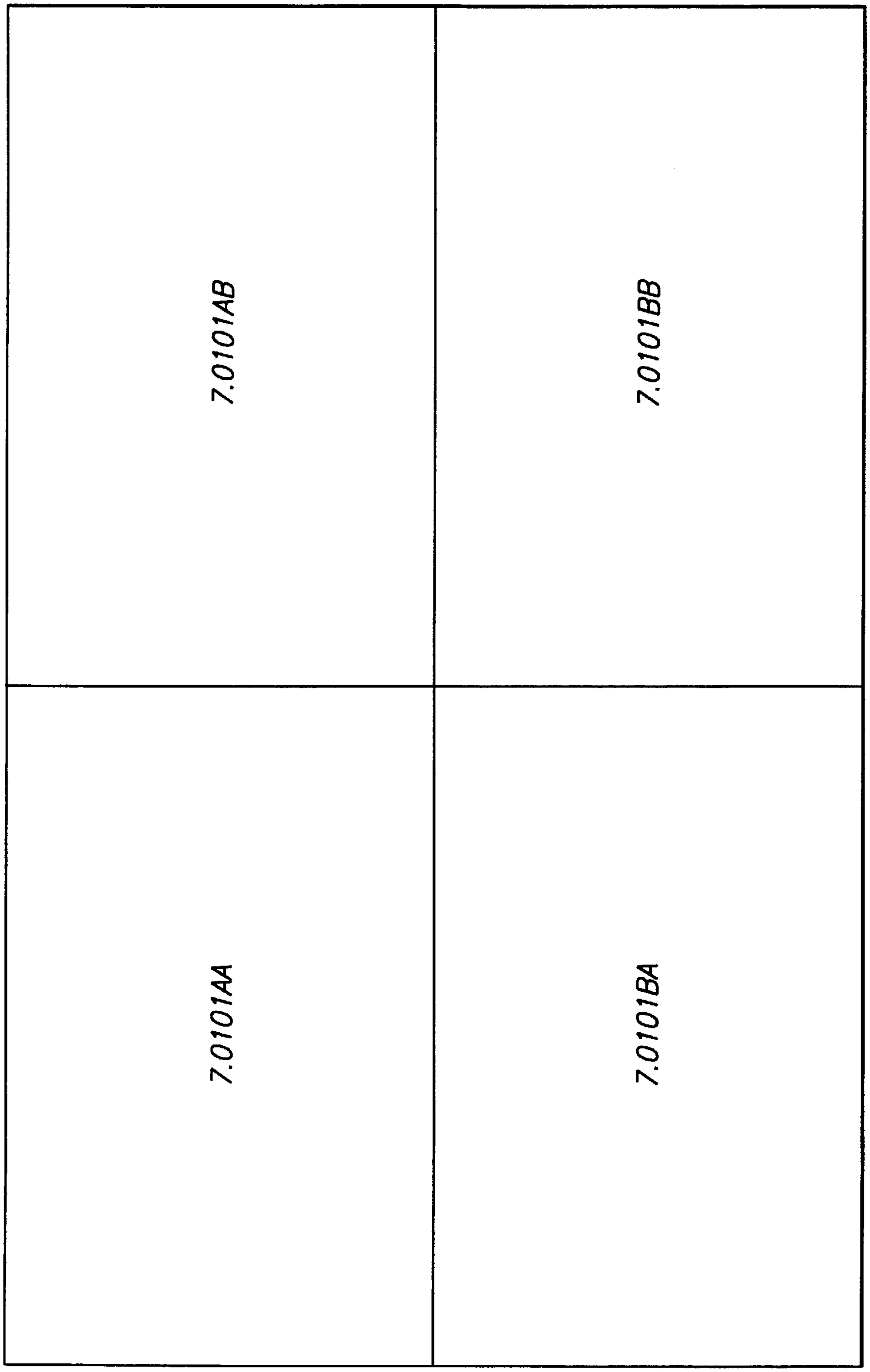
FIG. 7.0101

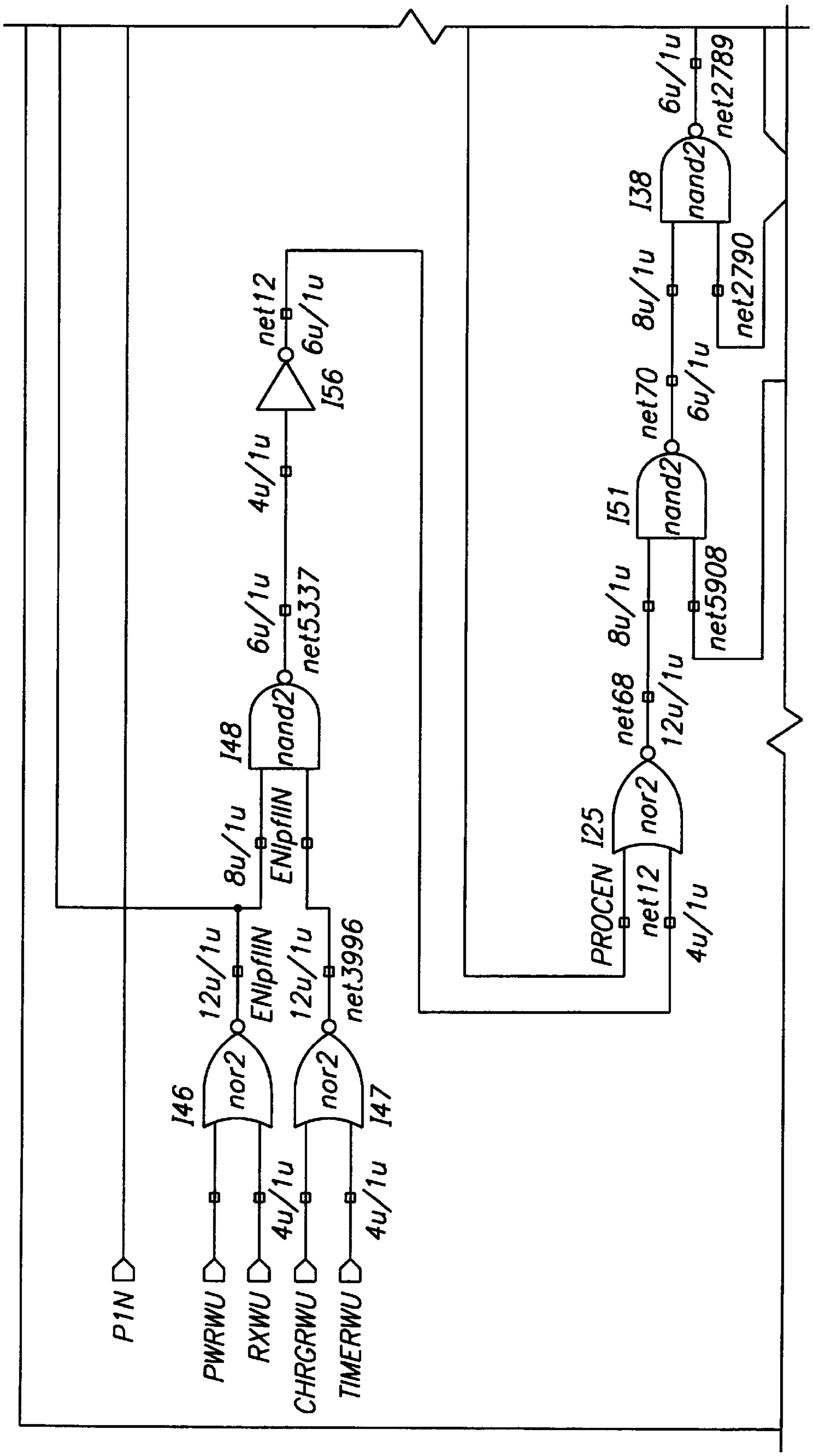
FIG. 7.01.01AA

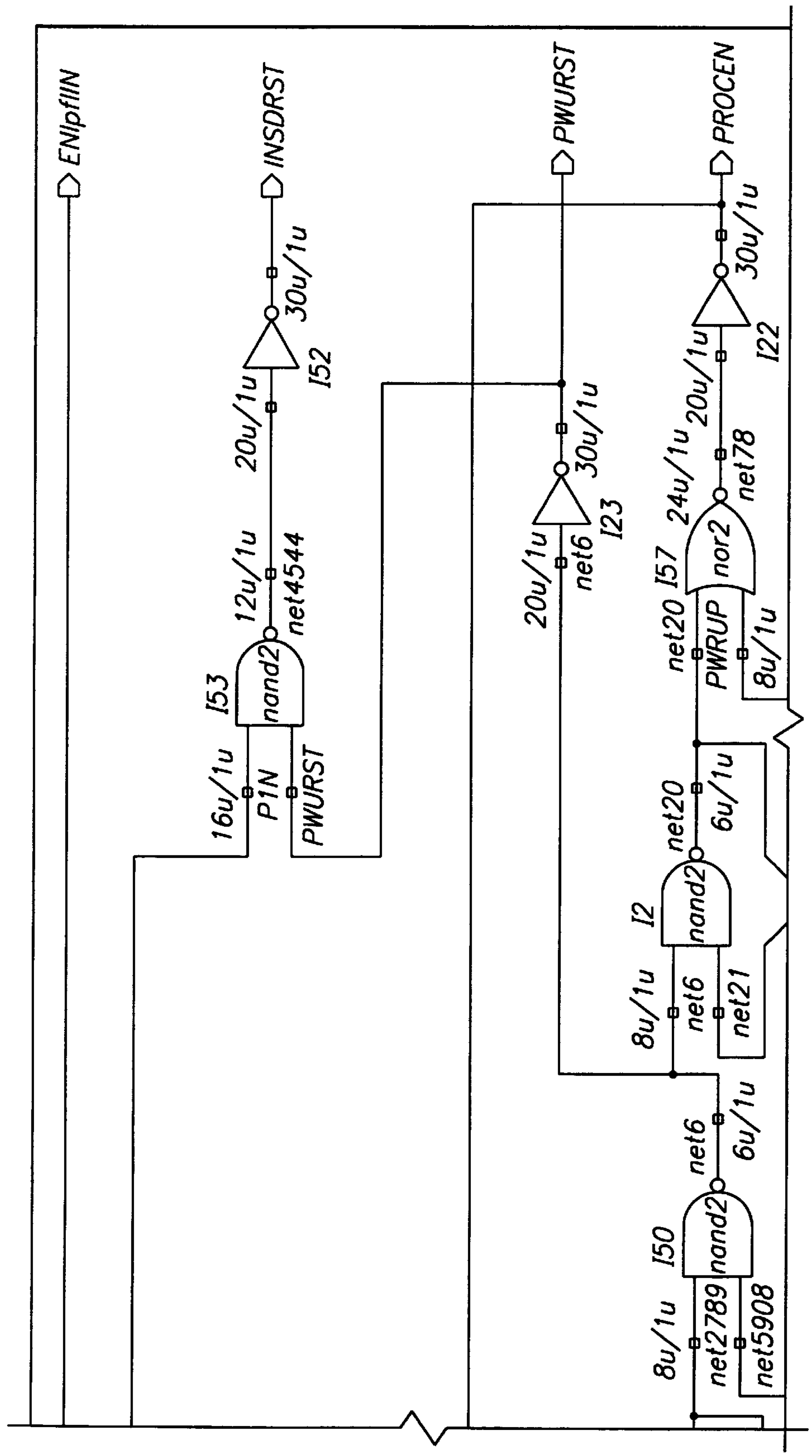
FIG. 7.00.10AB

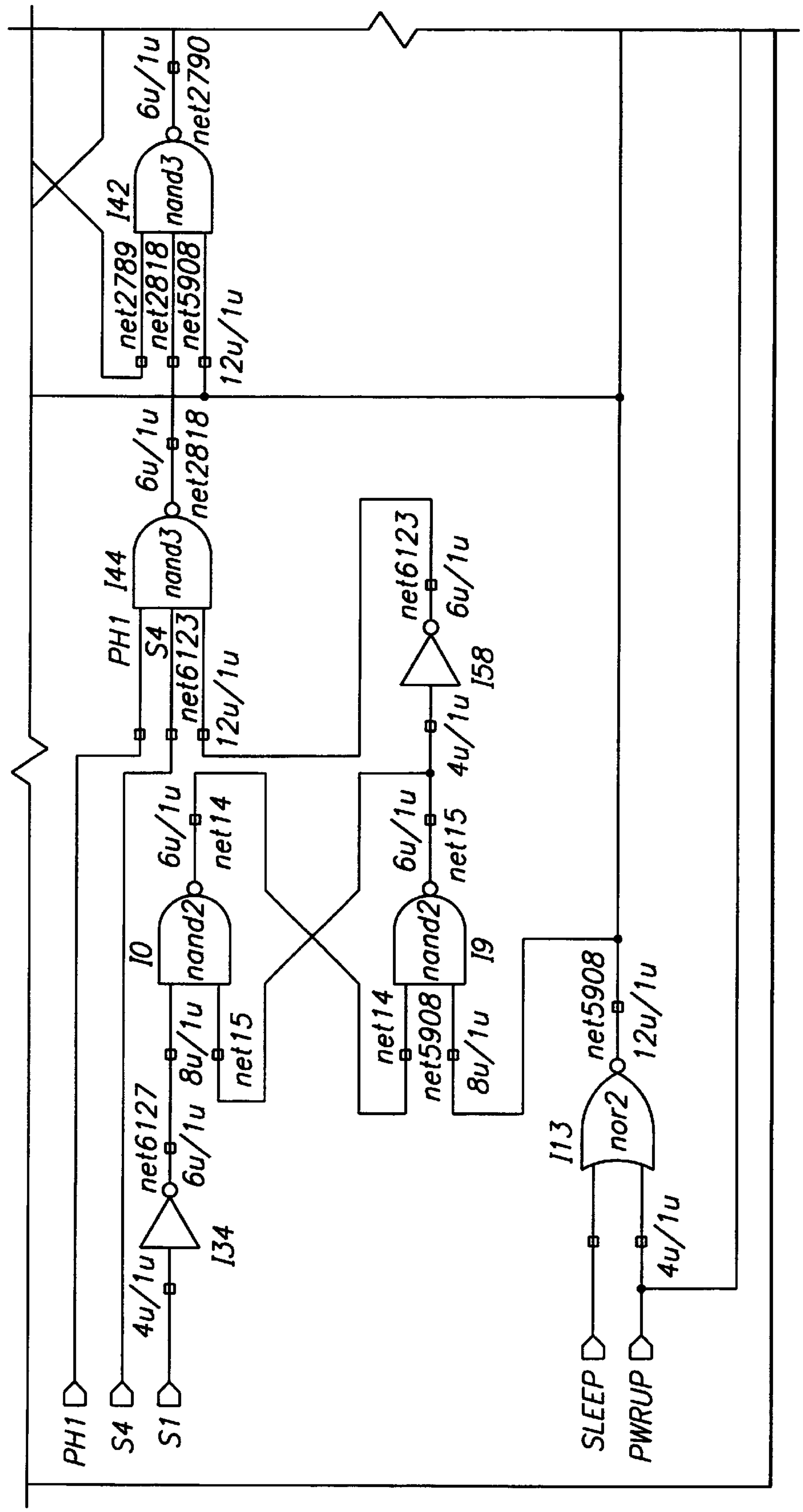
FIG. 7.0101BA

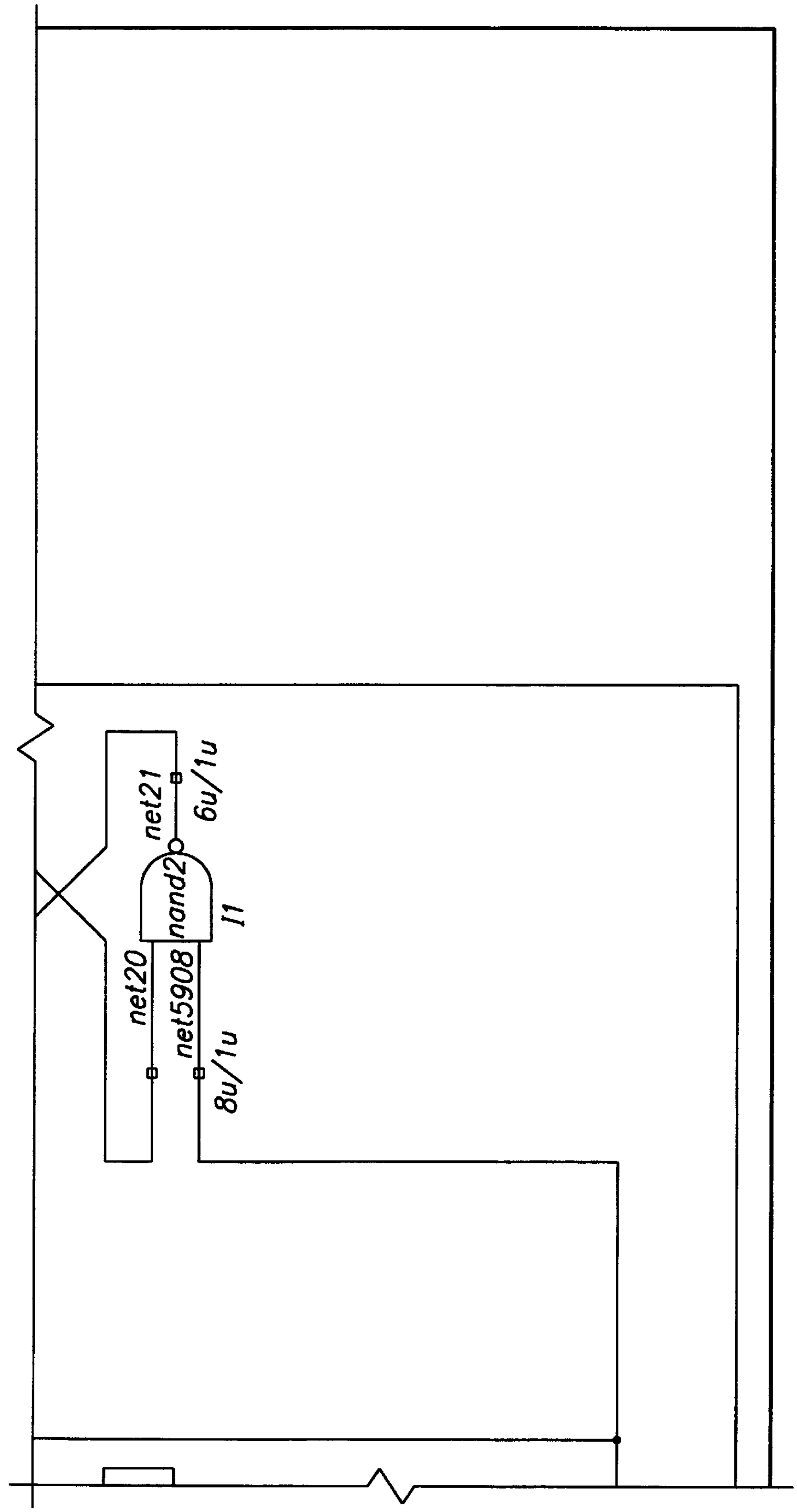
FIG. 7.010BB

| | | | | | | | | | |
|---|---|---|---|---|---|---|---|---|---|
| | | | | 7.0102AE | 7.0102AF | 7.0102AG | 7.0102AH | 7.0102AI | 7.0102AJ |
| 7.0102BA | 7.0102BB | 7.0102BC | 7.0102BD | 7.0102BE | 7.0102BF | 7.0102BG | 7.0102BH | 7.0102BI | 7.0102BJ |
| 7.0102CA | 7.0102CB | 7.0102CC | 7.0102CD | 7.0102CE | 7.0102CF | 7.0102CG | 7.0102CH | 7.0102CI | 7.0102CJ |
| 7.0102DA | 7.0102DB | 7.0102DC | 7.0102DD | 7.0102DE | 7.0102DF | 7.0102DG | 7.0102DH | 7.0102DI | 7.0102DJ |

Fig. 7.0102

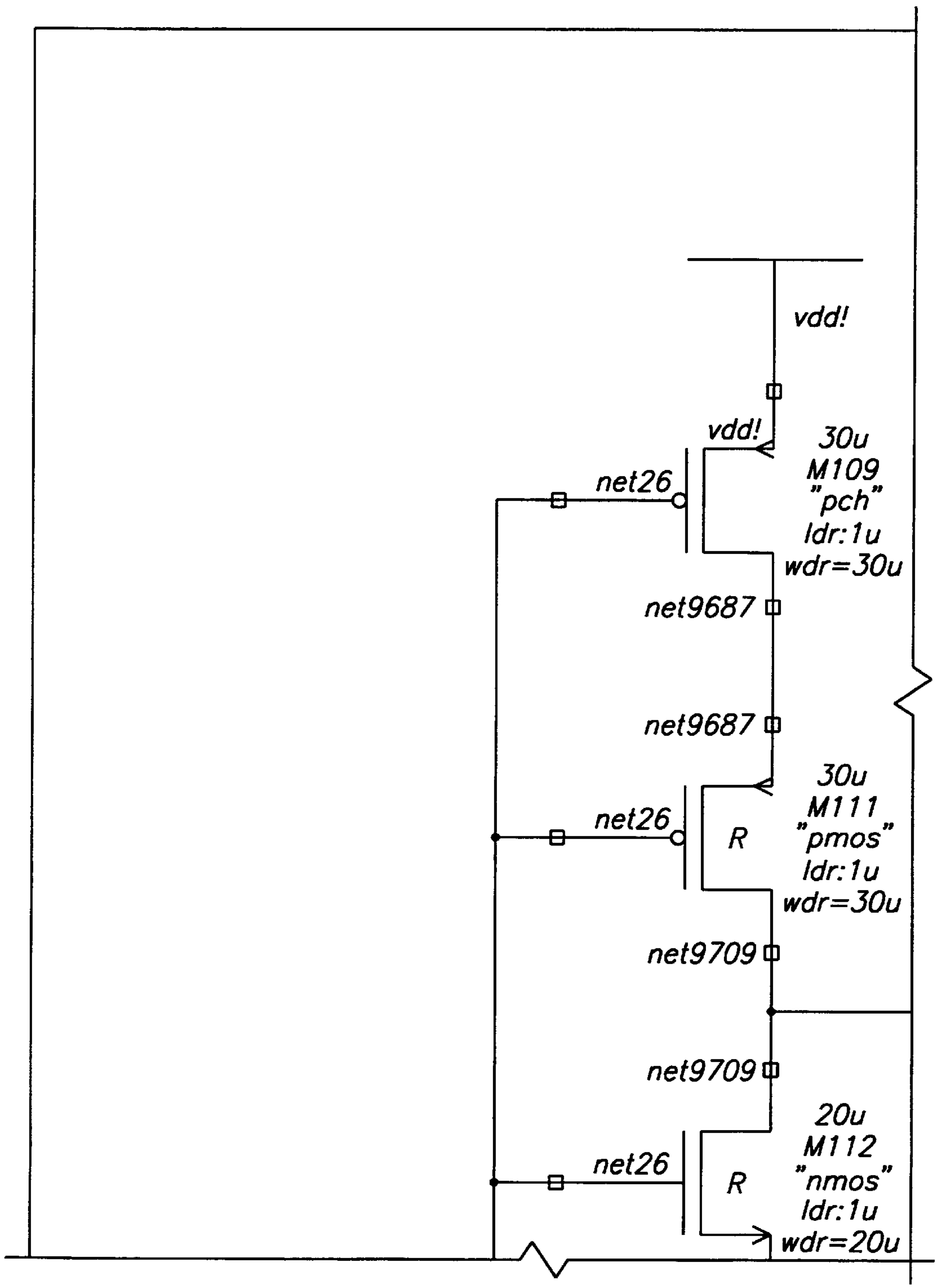
Fig 7.0102AE

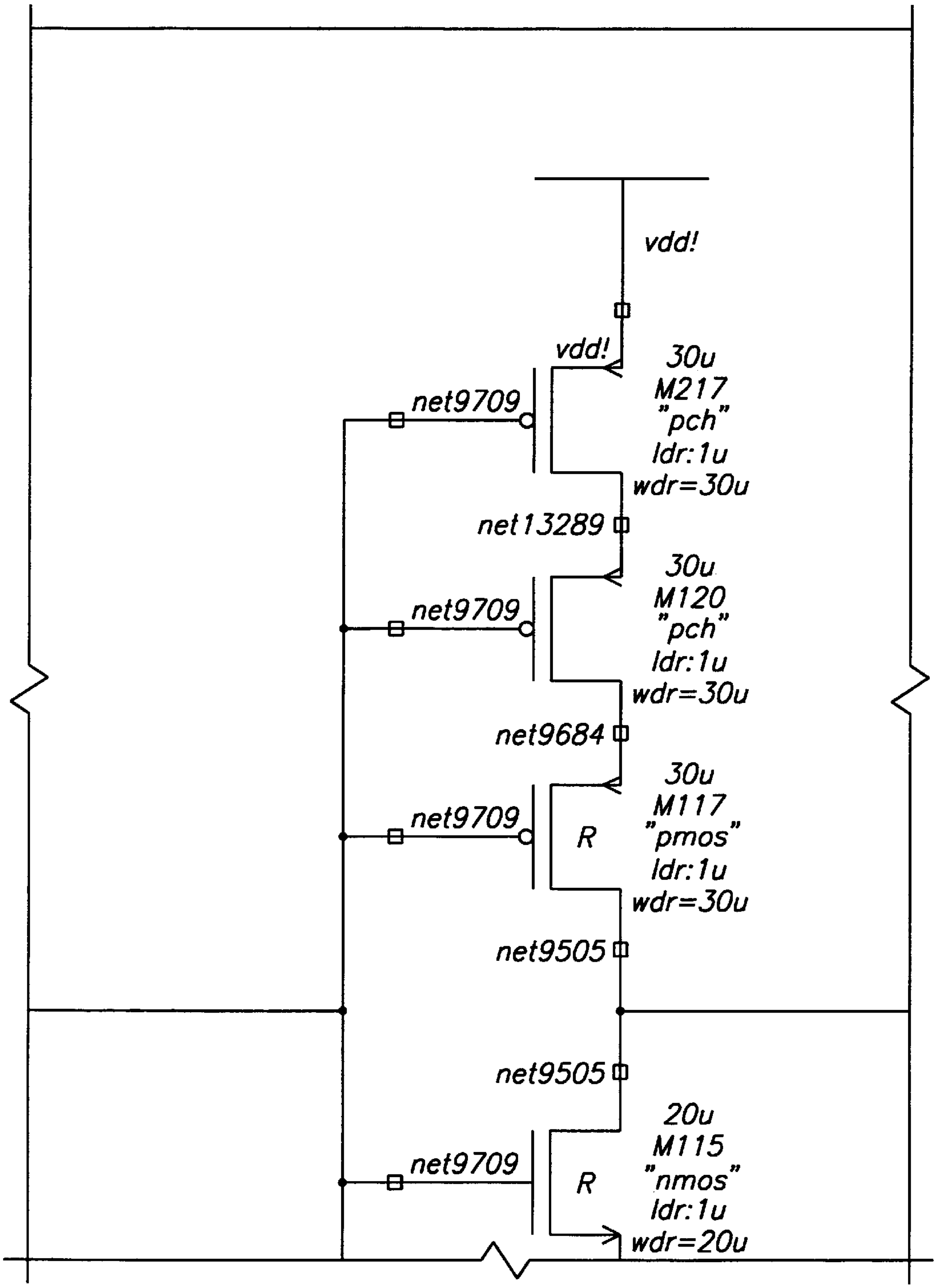
Fig 1.0102AF

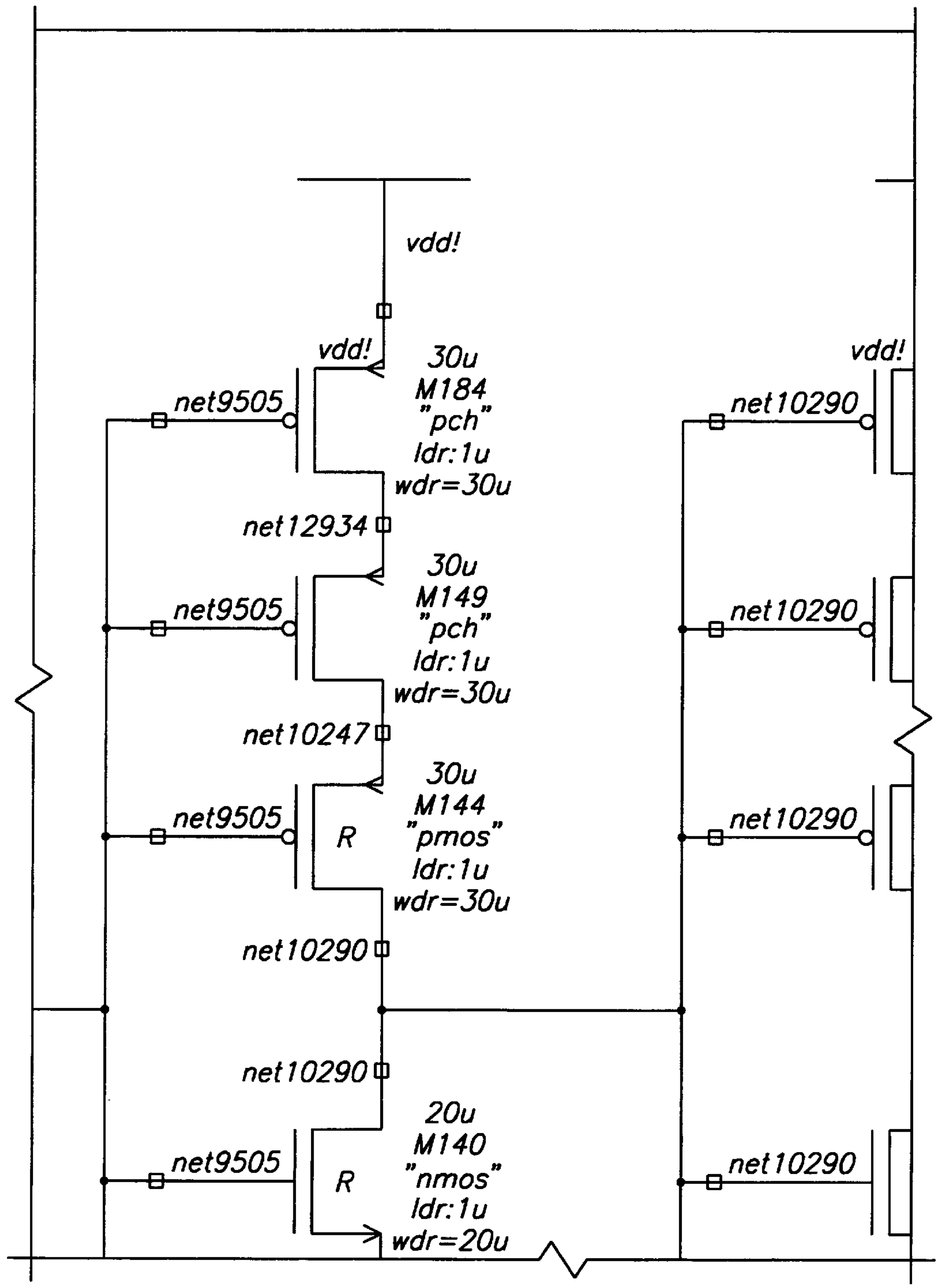
Fig 1.0102AG

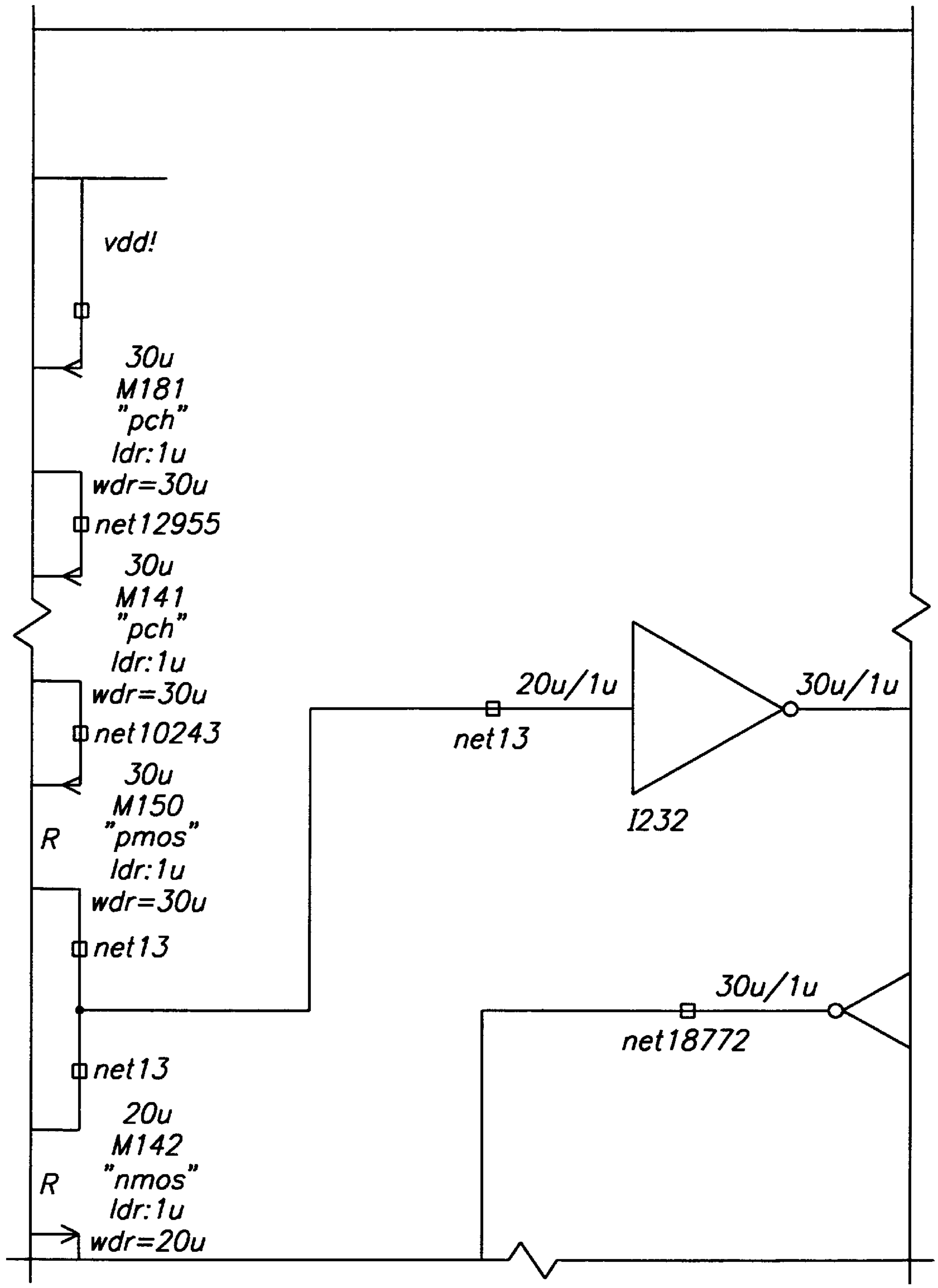
FIG 7.0102AH

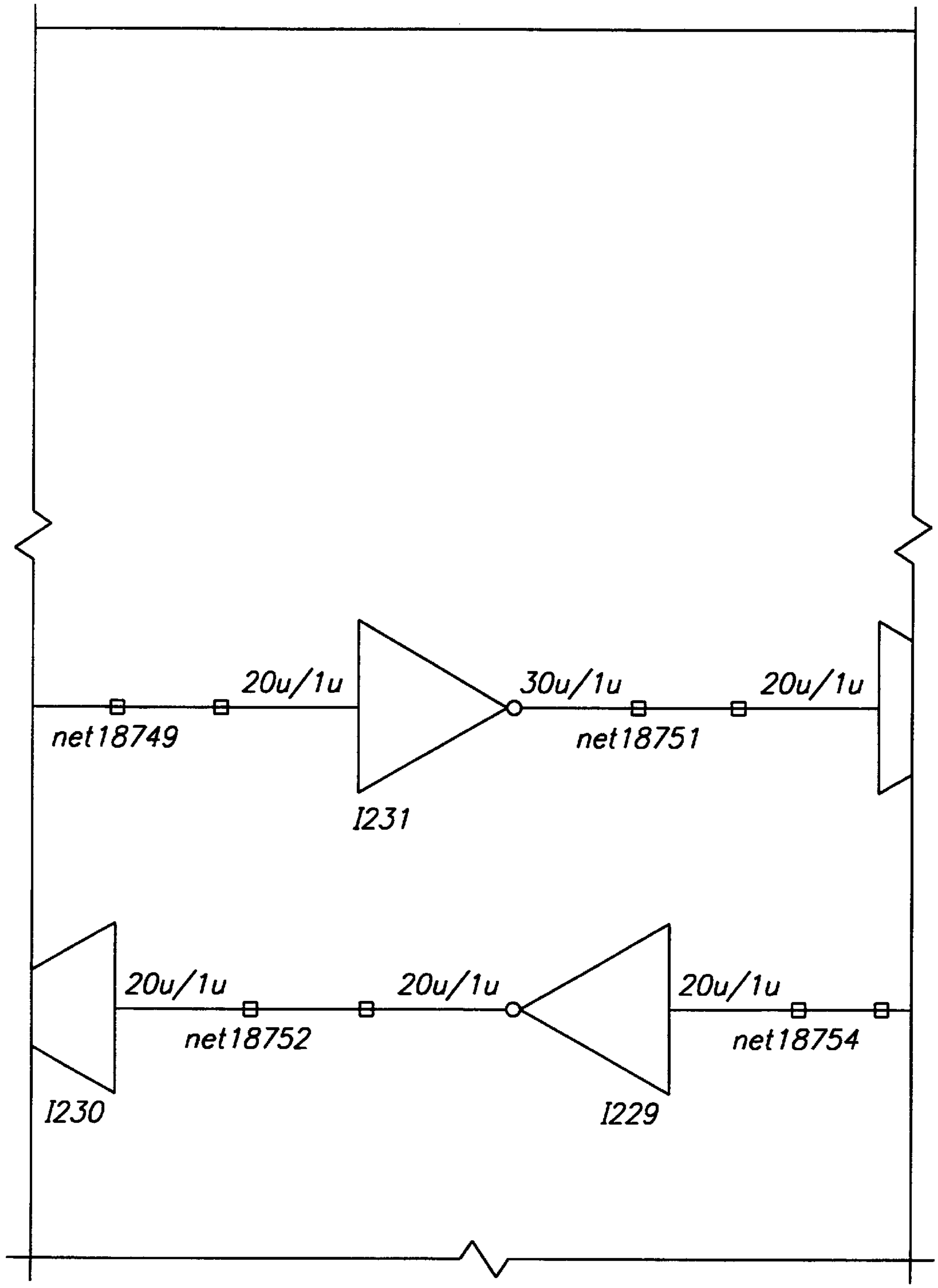
Fig 7.0102AI

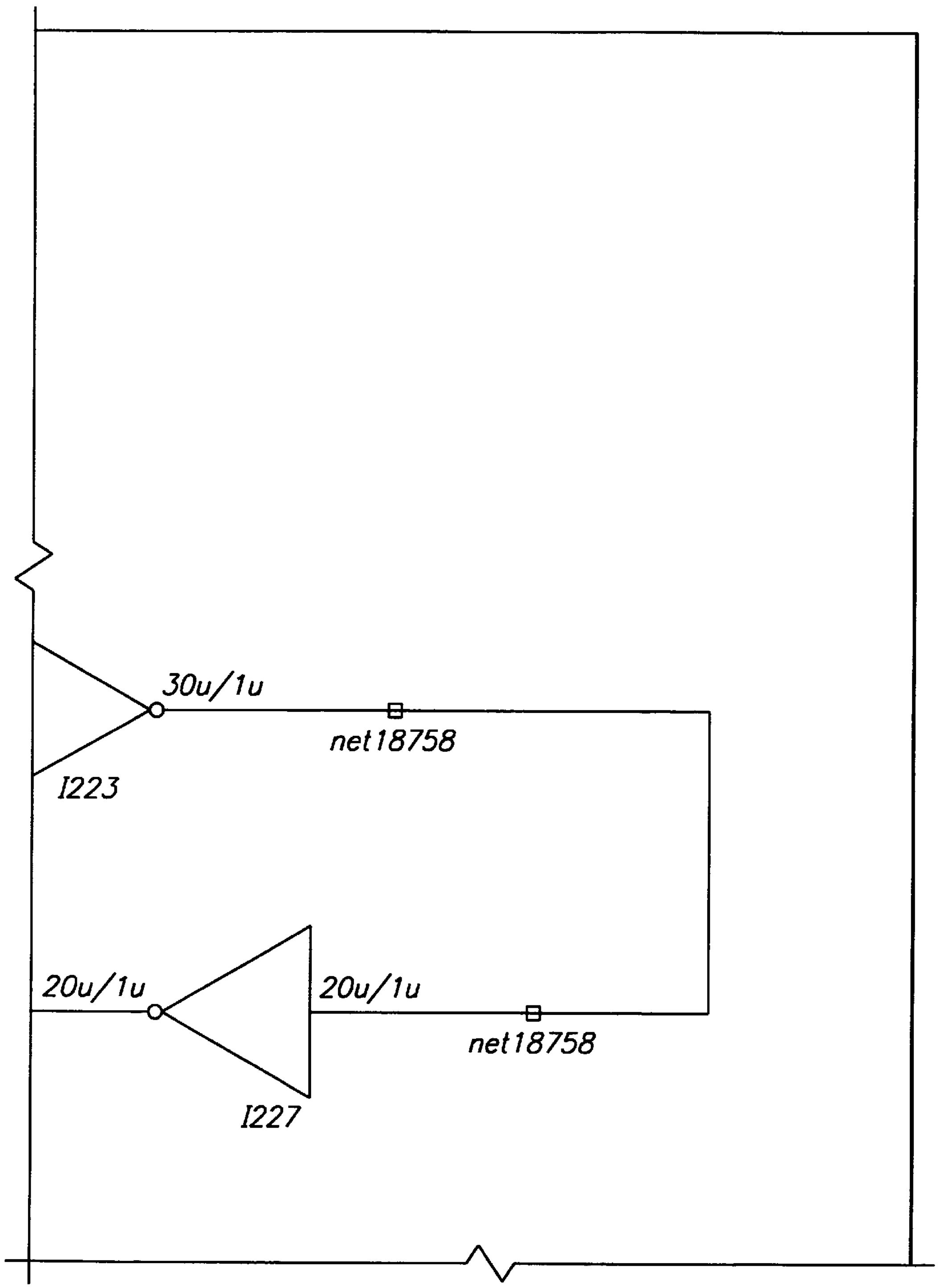
Fig 1.0102AJ

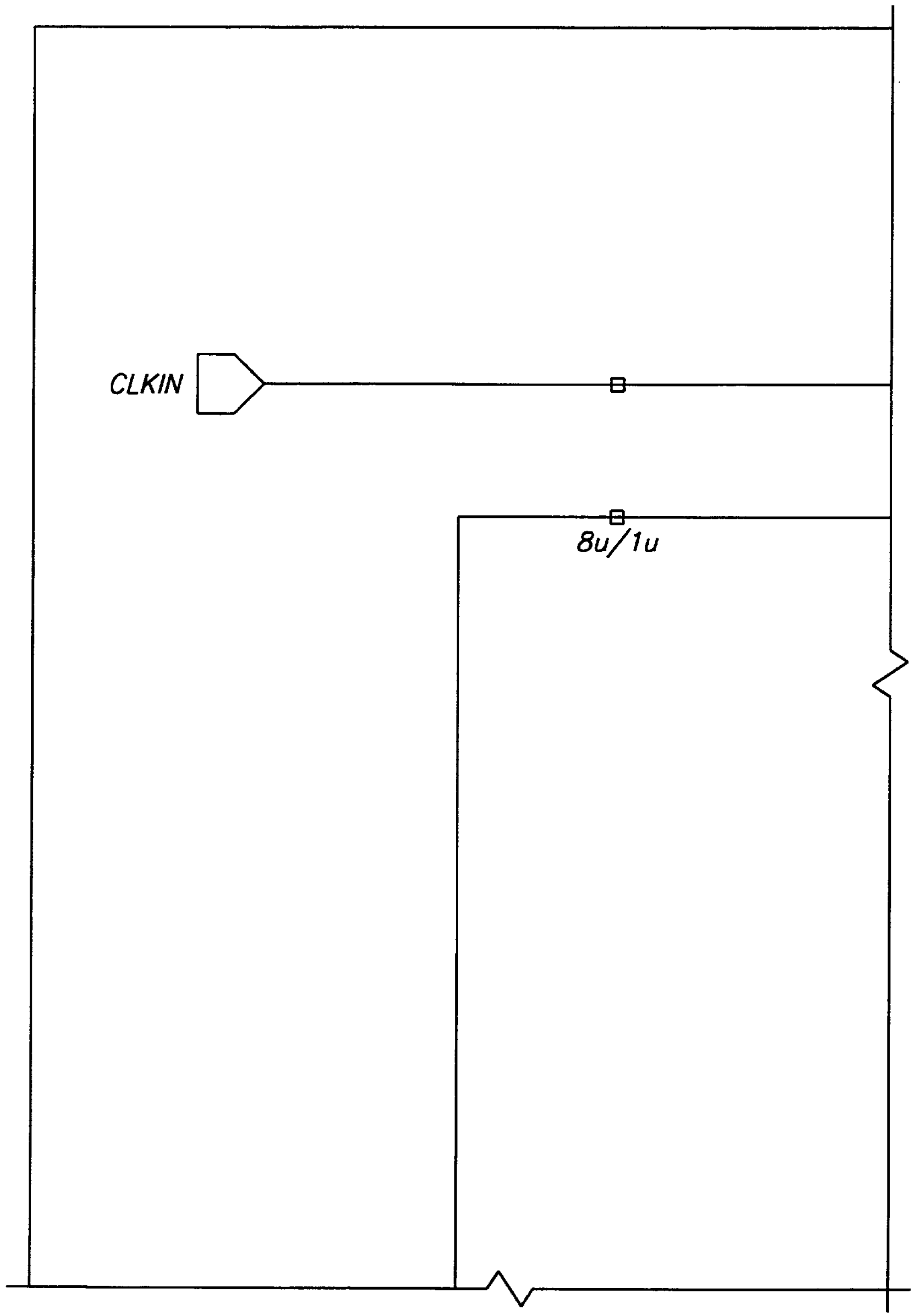
Fig 7.0102BA

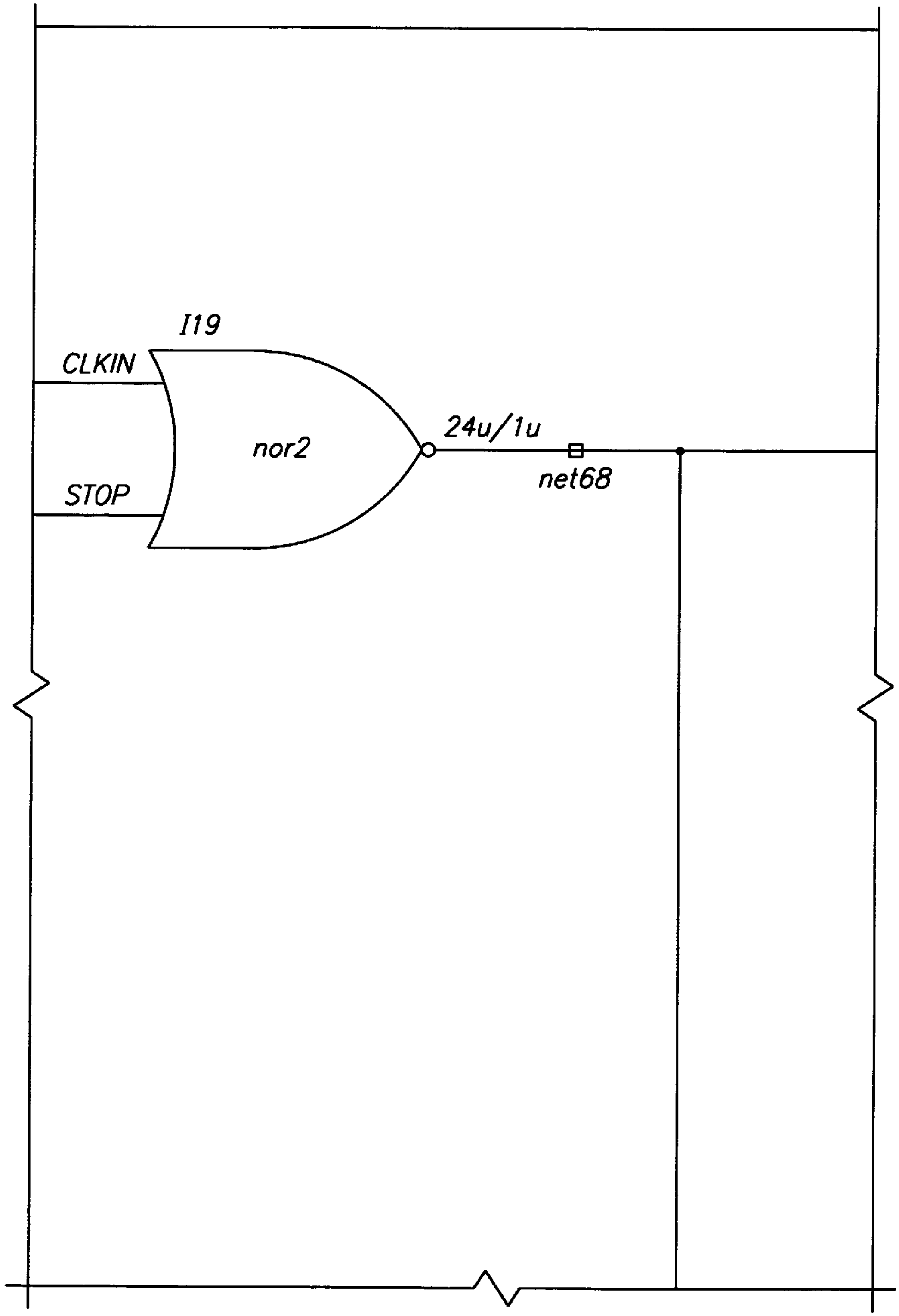
Fig 1.0102BB

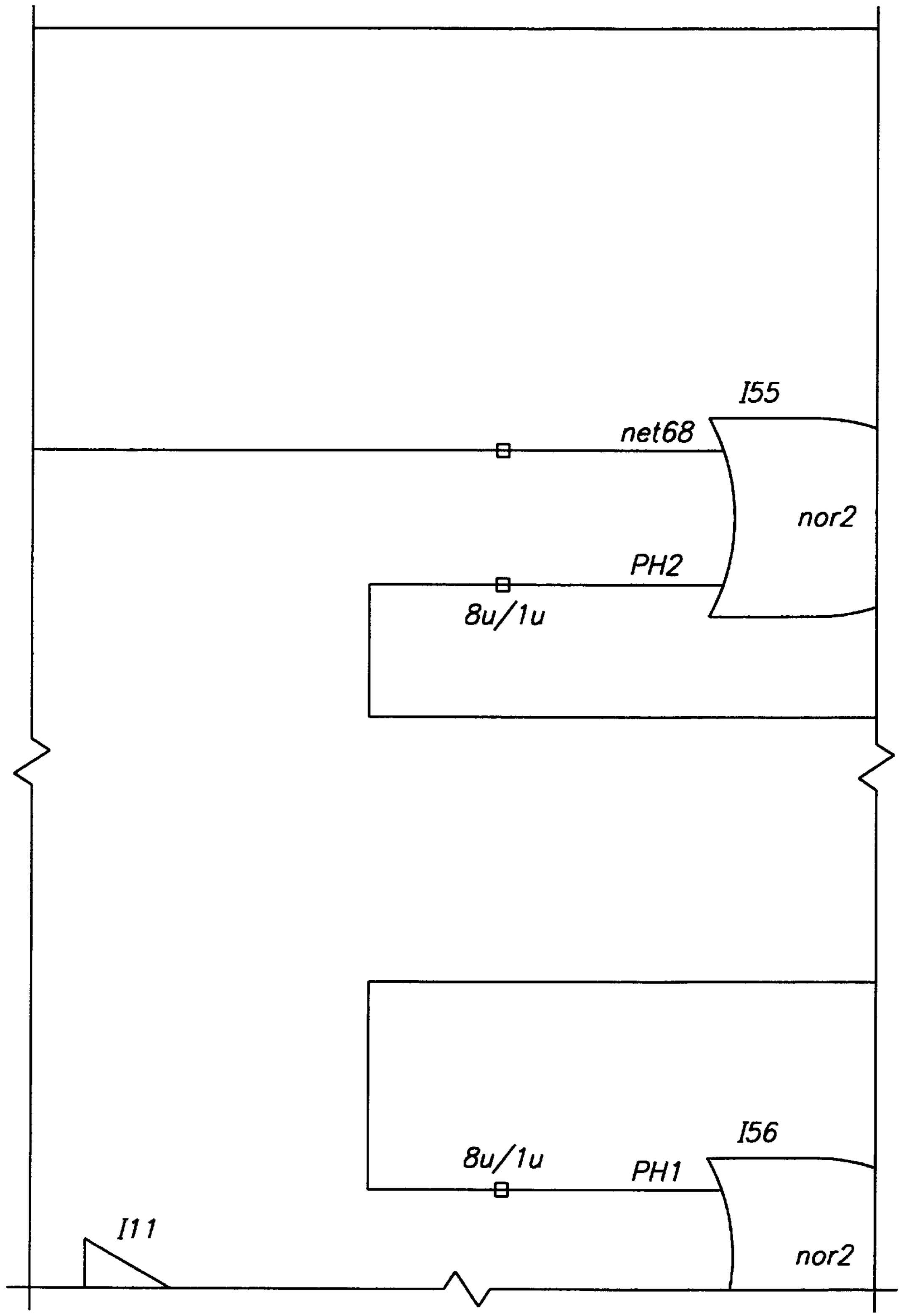
Fig 7.0102BC

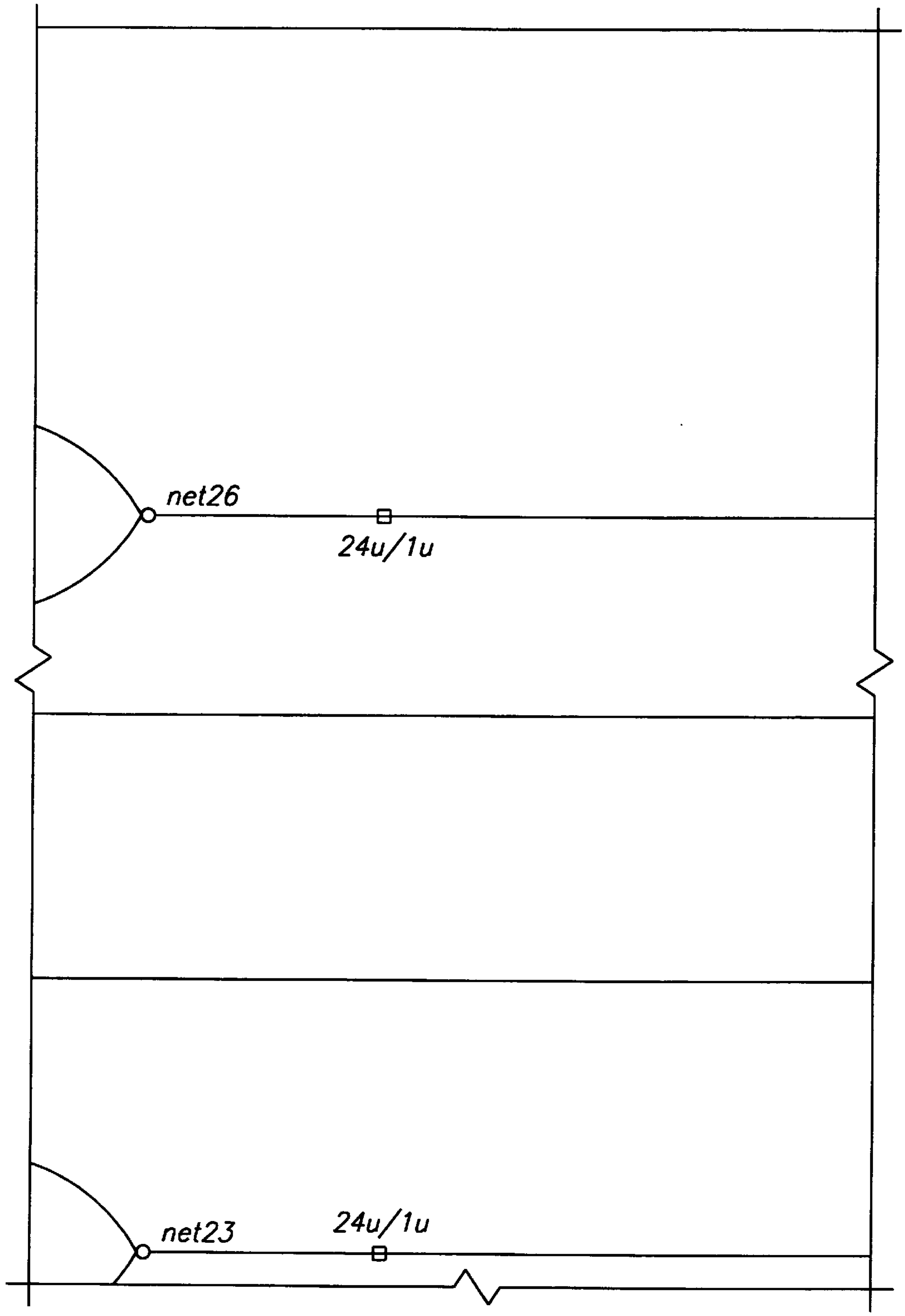
Fig 1.0102BD

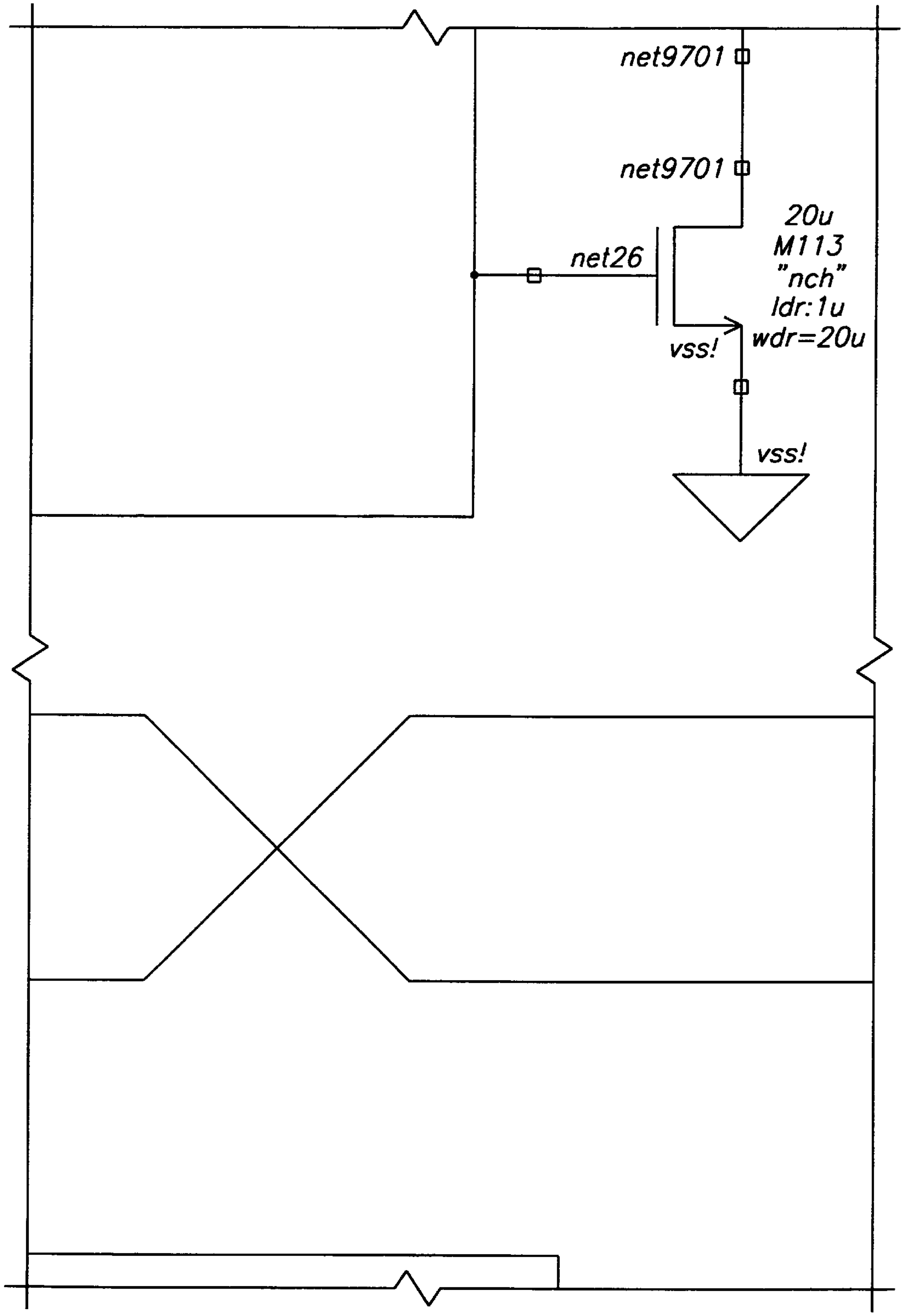
Fig 7.0102BE

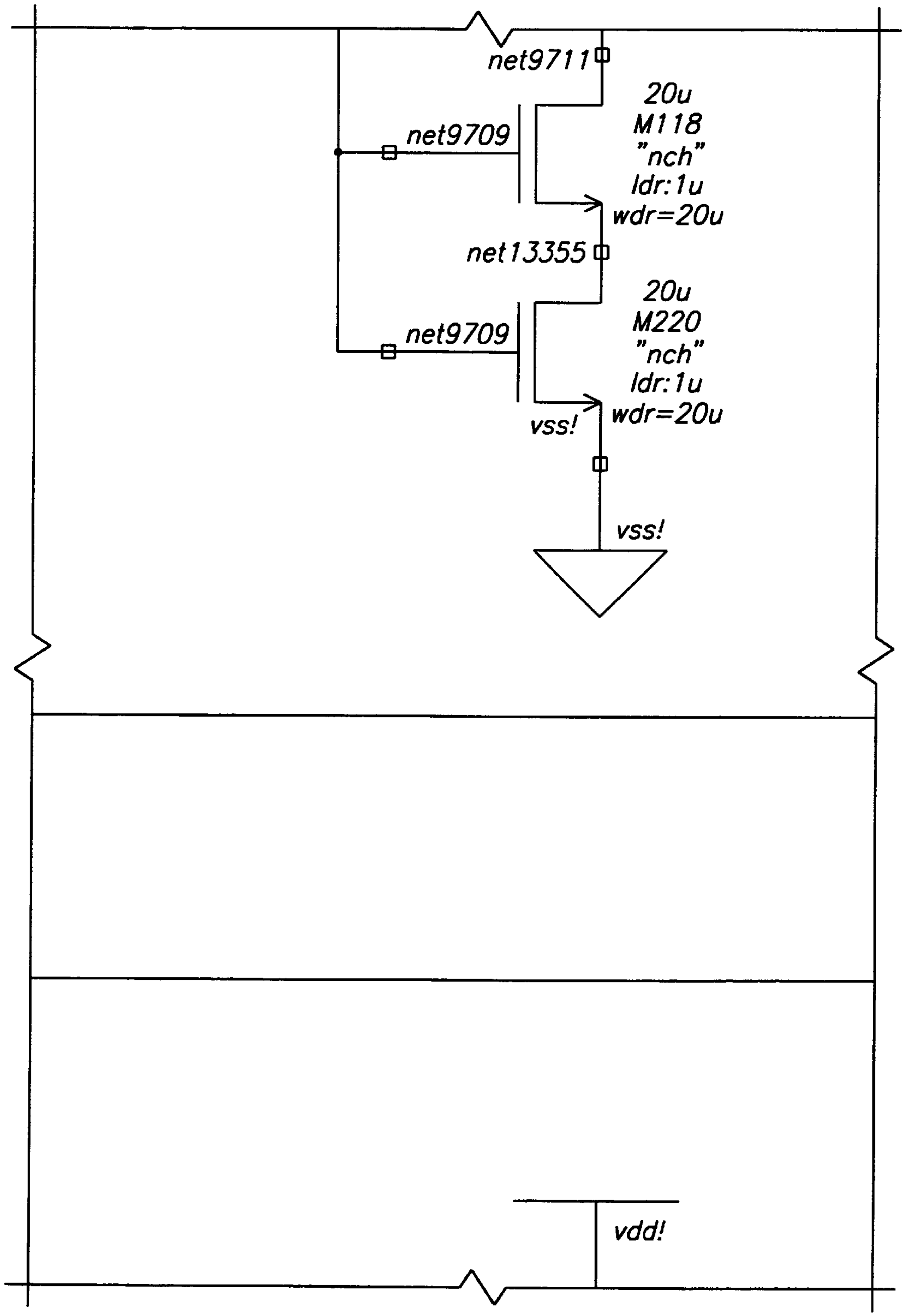
Fig 7.0102BF

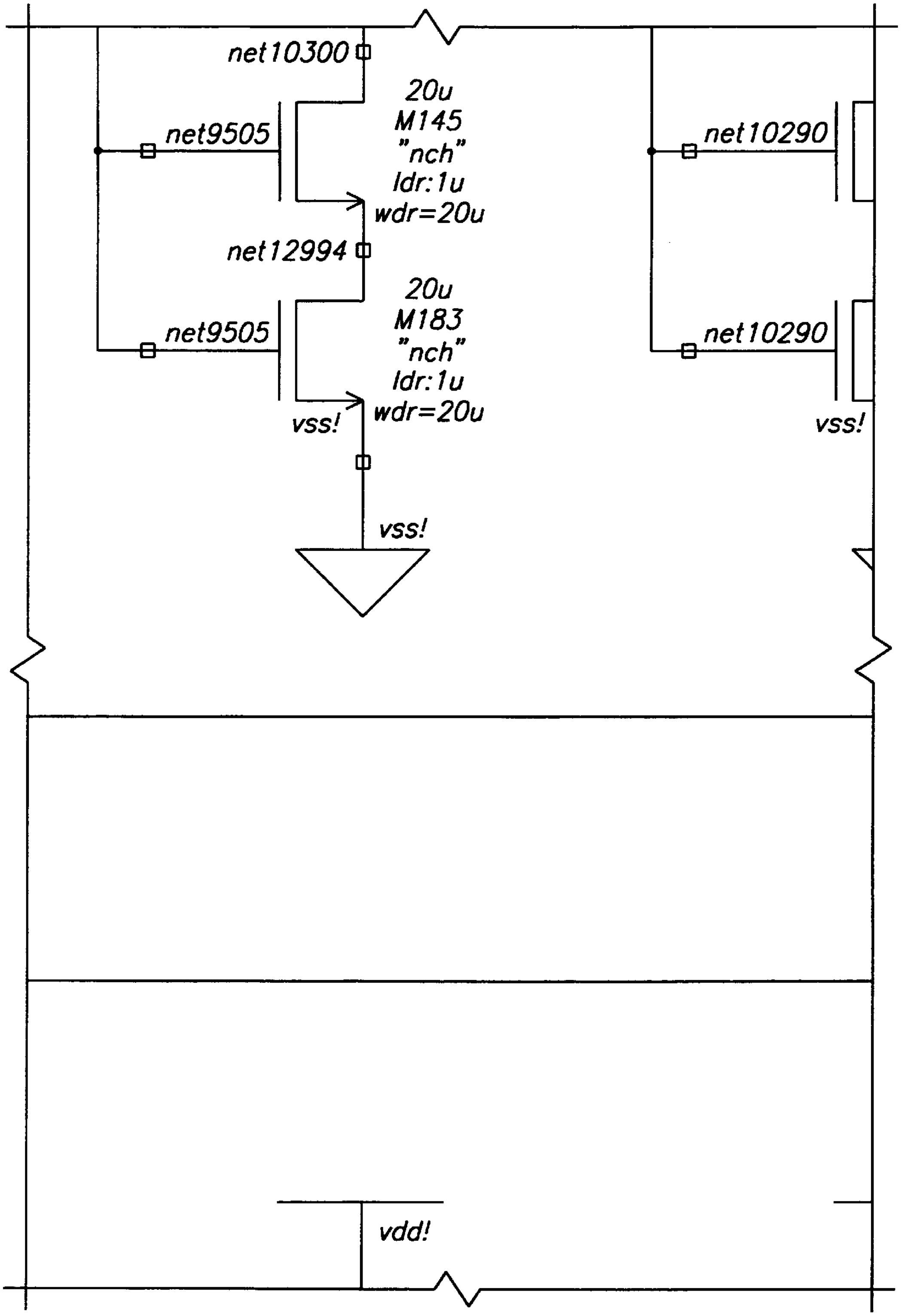
FIG. 7.0102BG

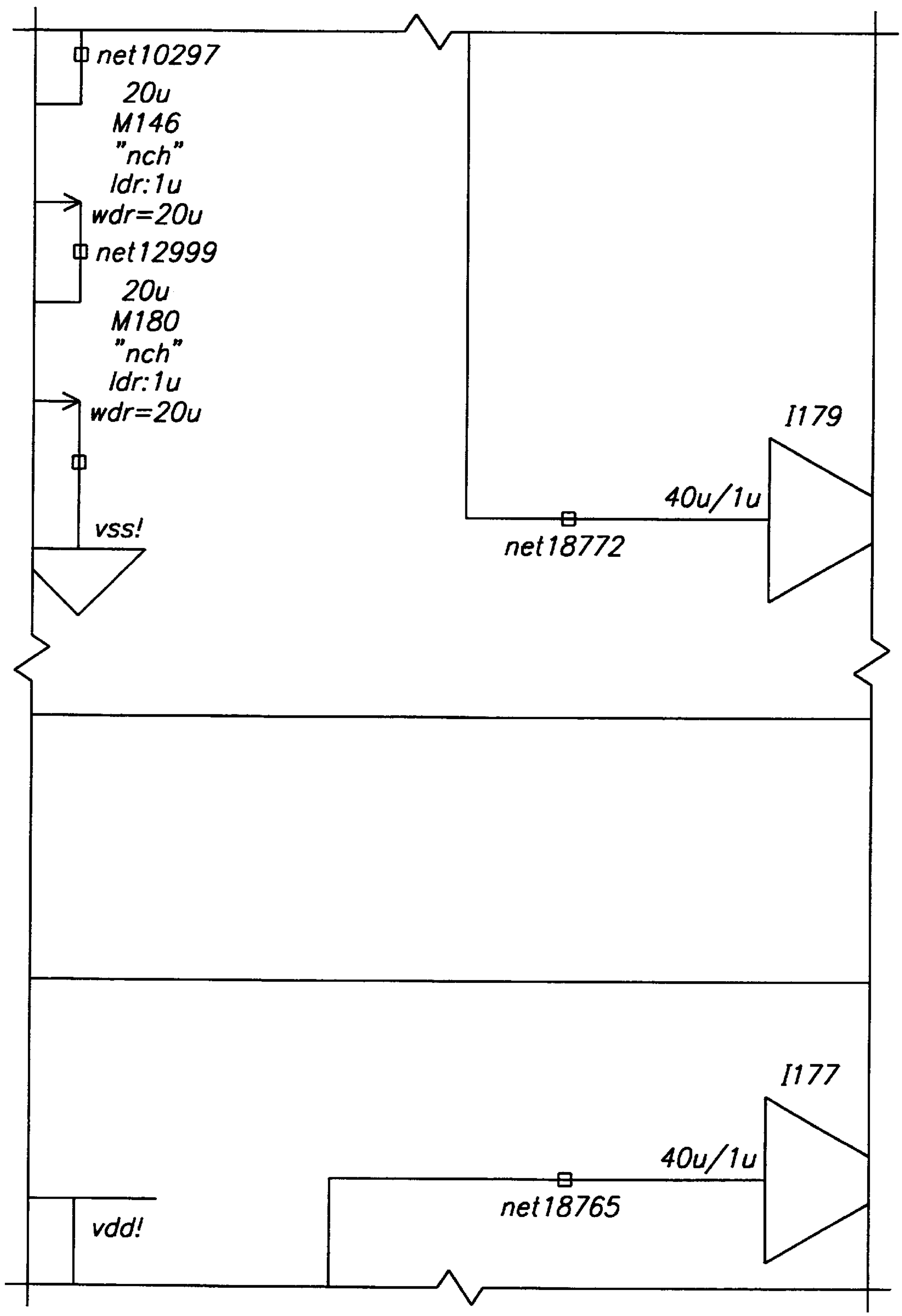
Fig 1.0102BH

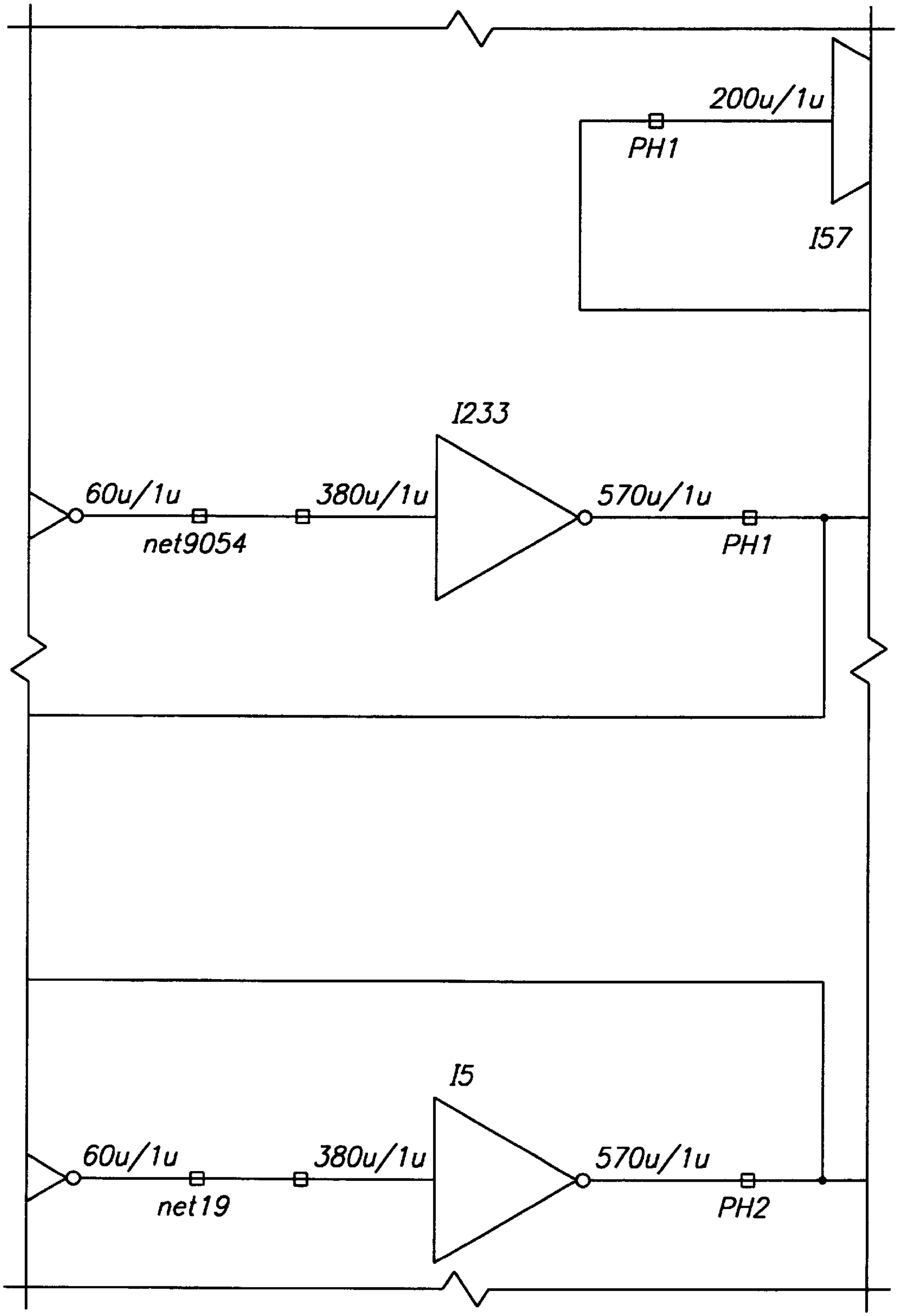
Fig 1.0102BI

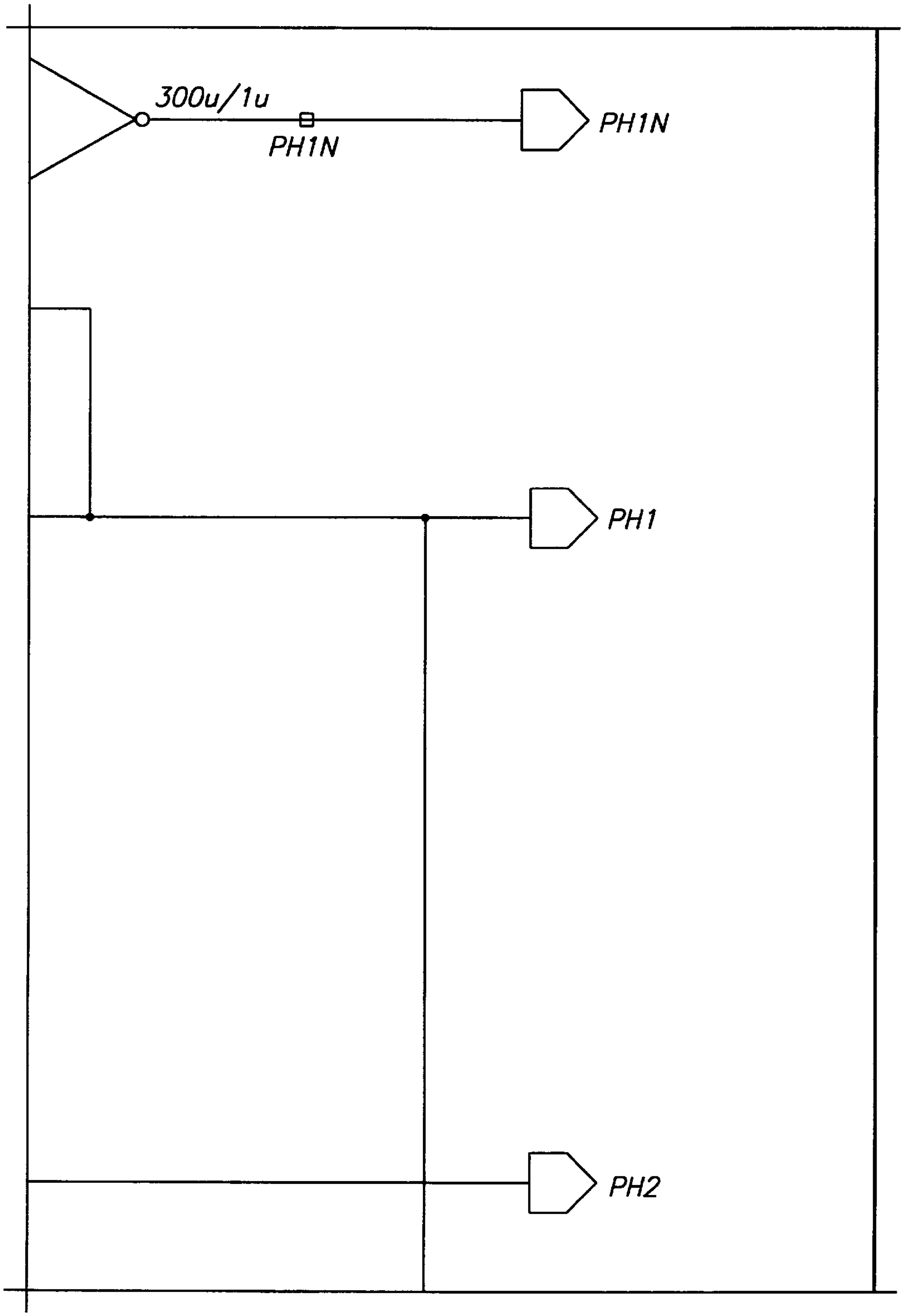
Fig 7.0102B.1

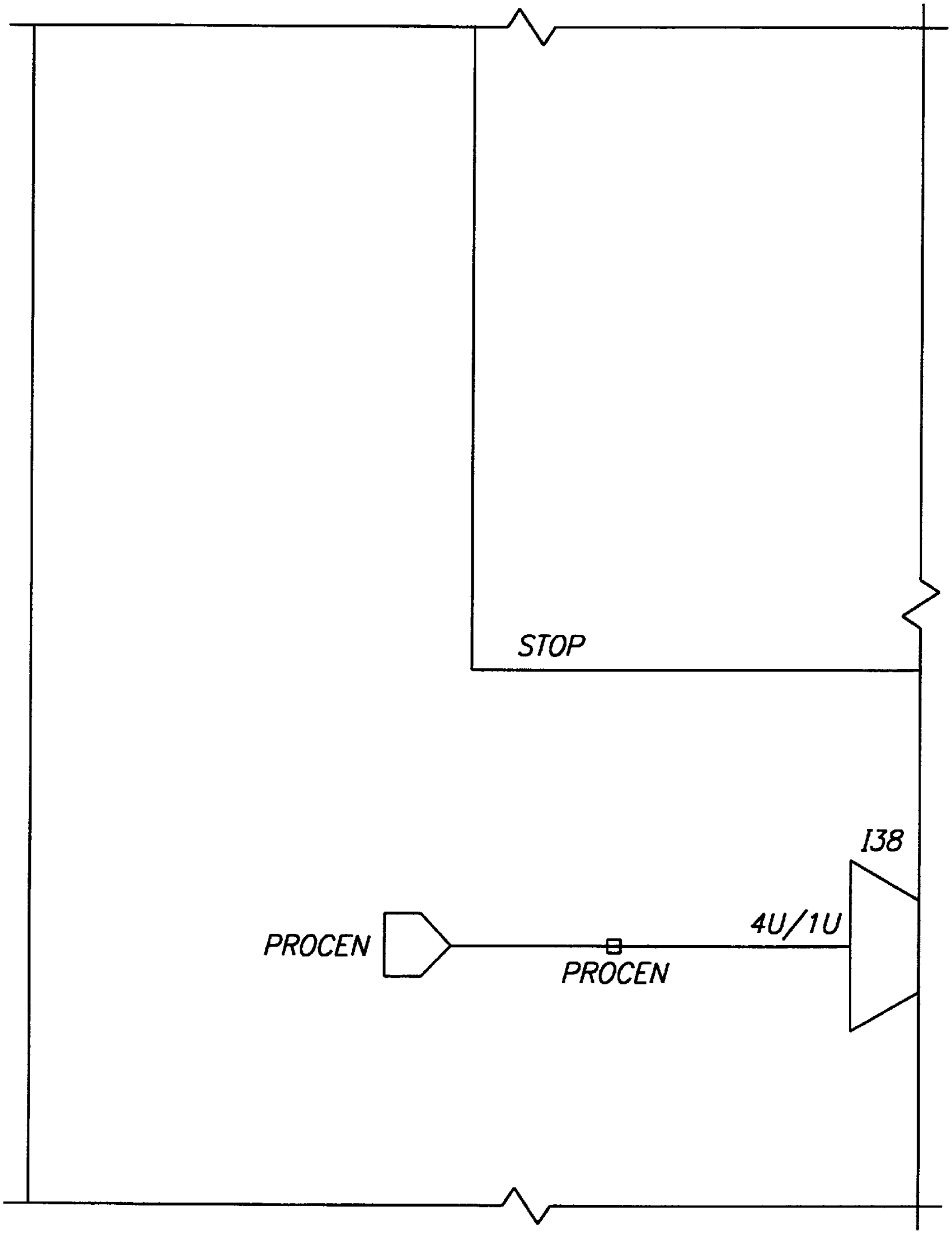
Fig 7.0102CA

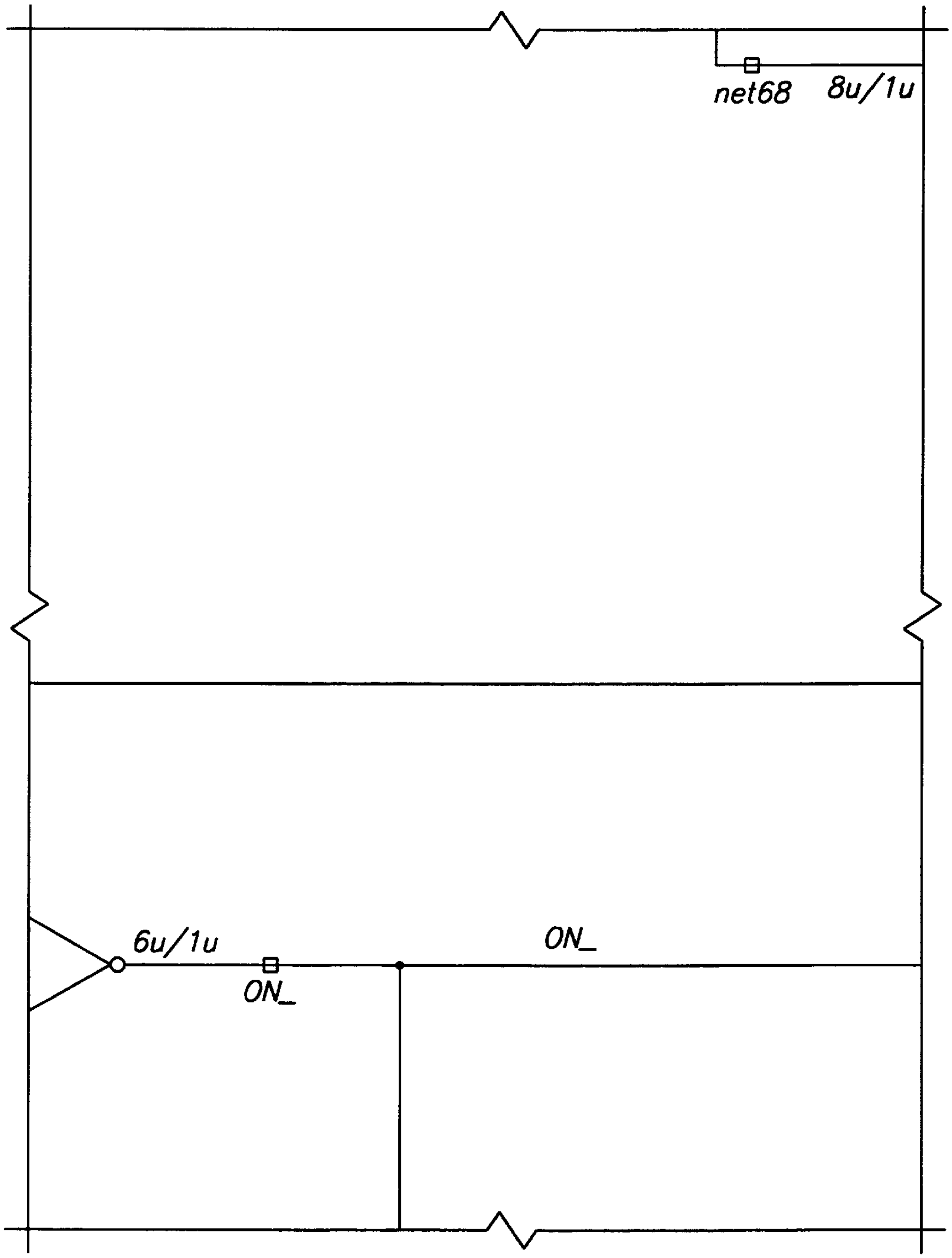
Fig 7.0102CB

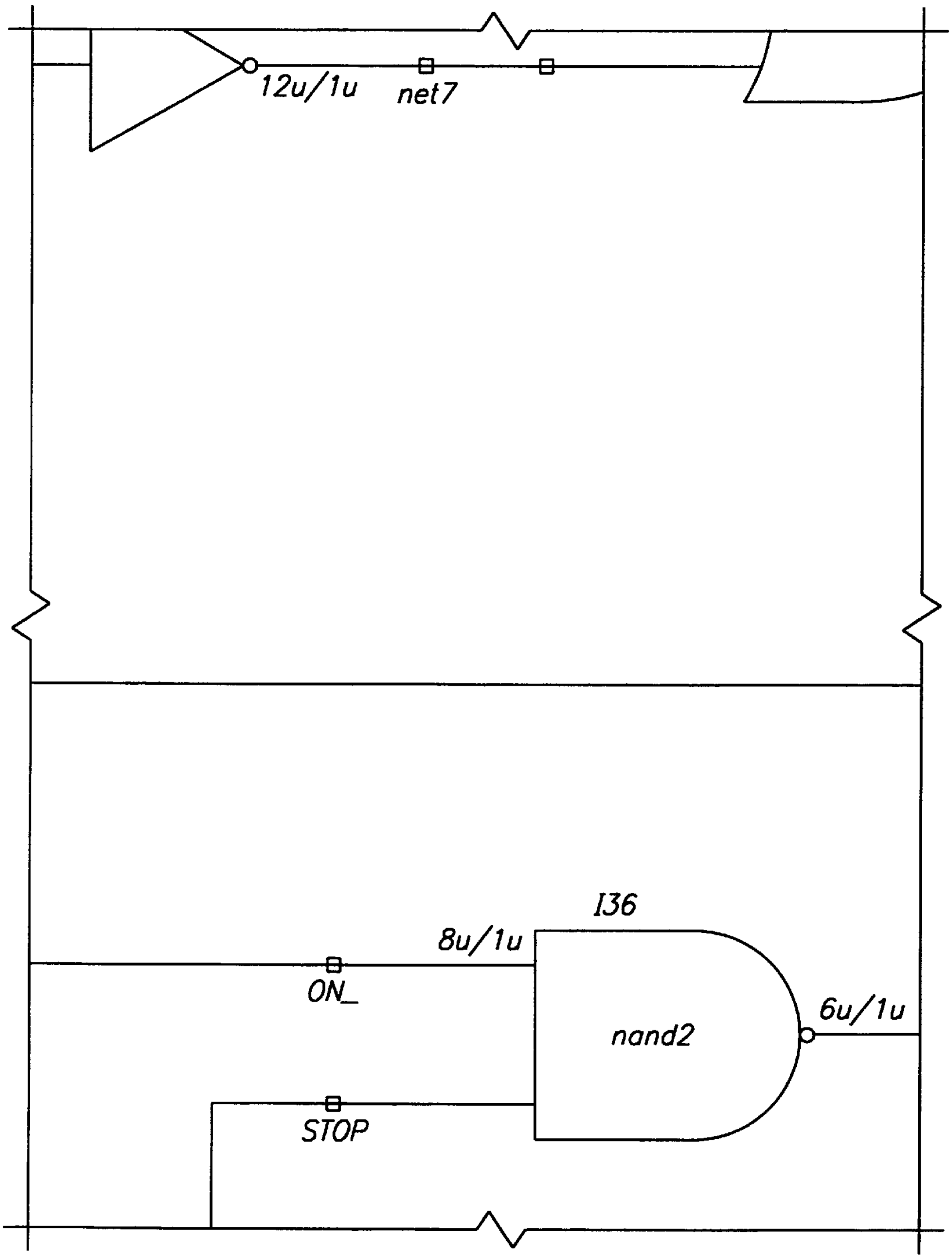
Fig 7.0102CC

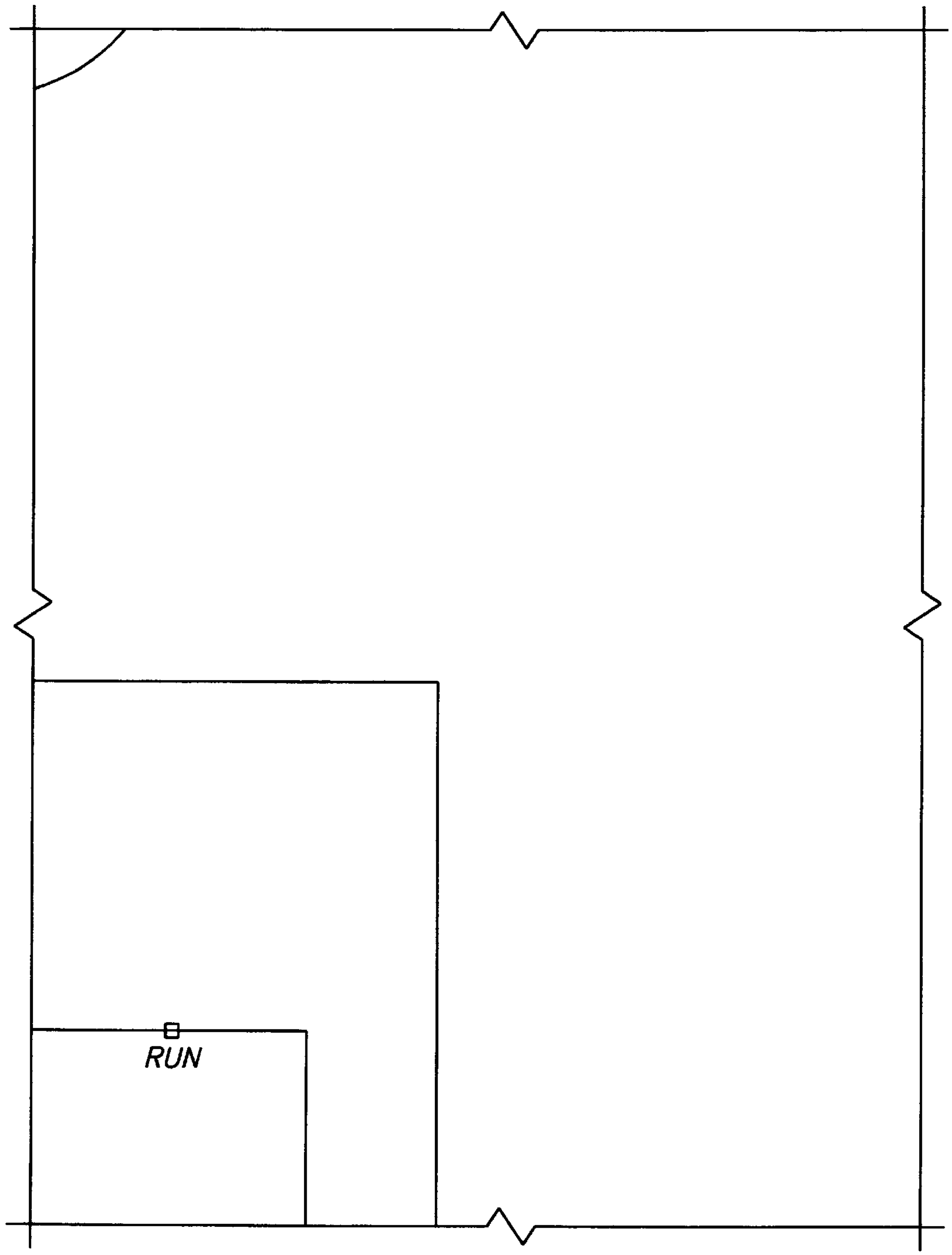
Fig 1.0102CD

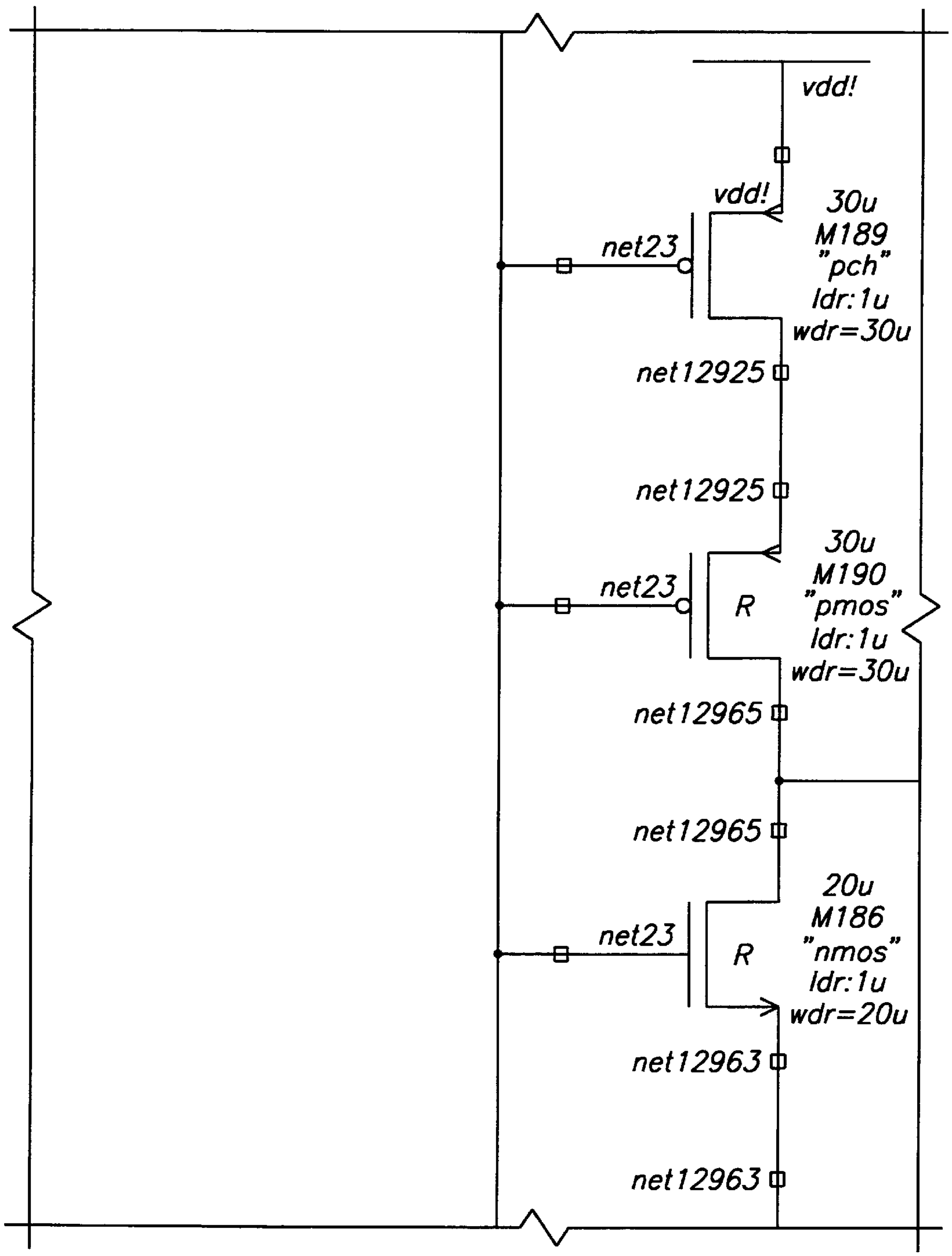
Fig 7.0102CE

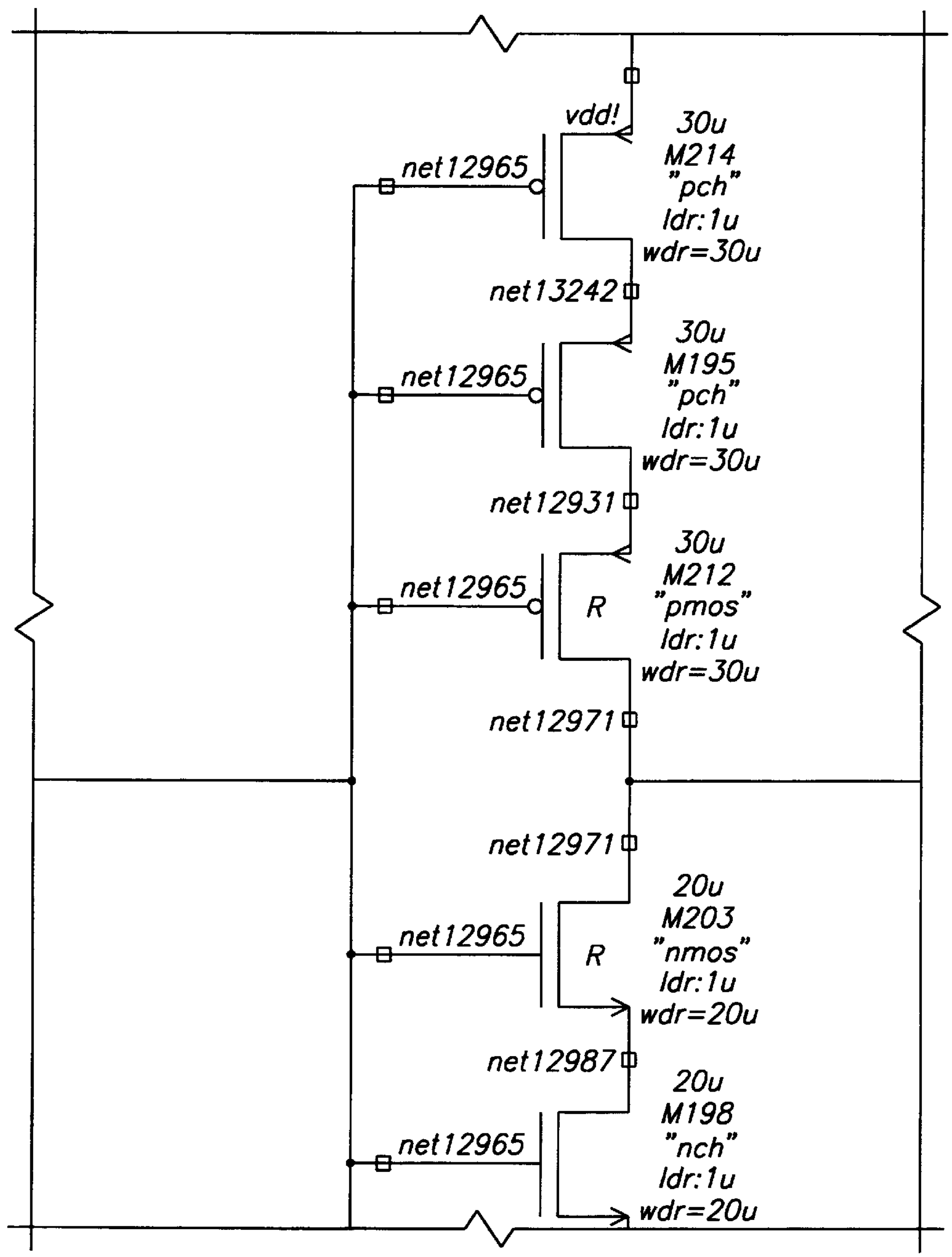
FIG 7.0102CF

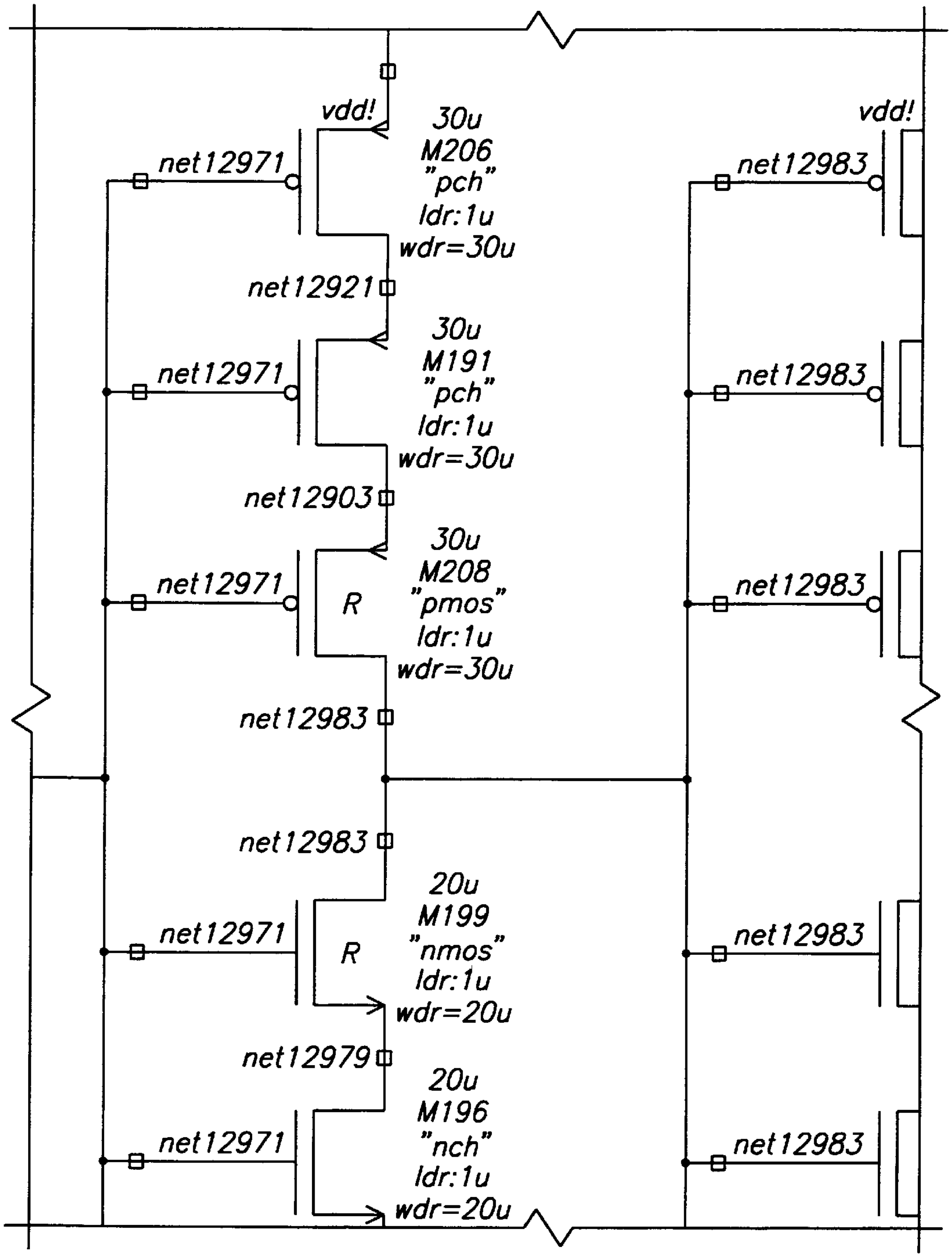
FIG 1.0102CG

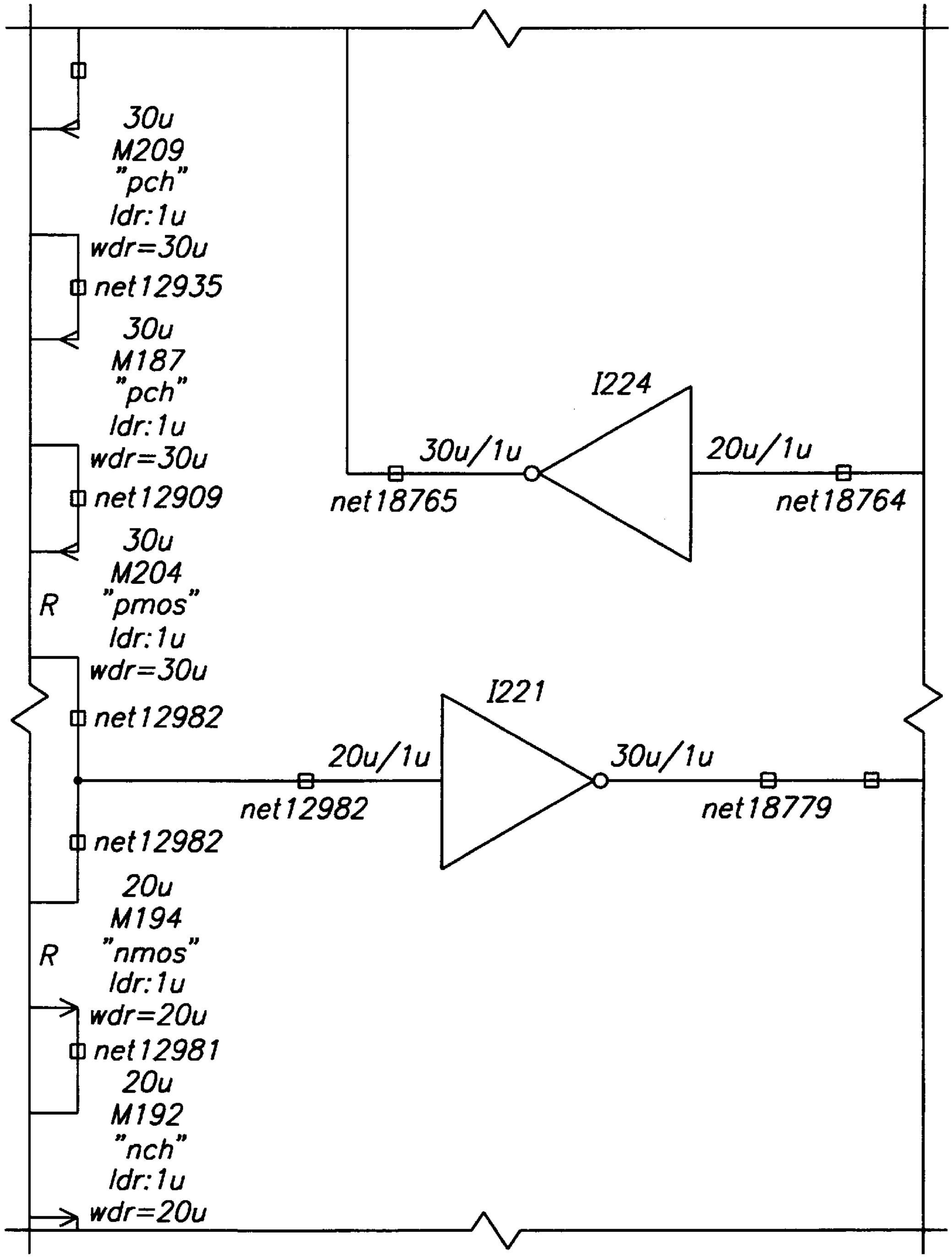
FIG. 7.0102CH

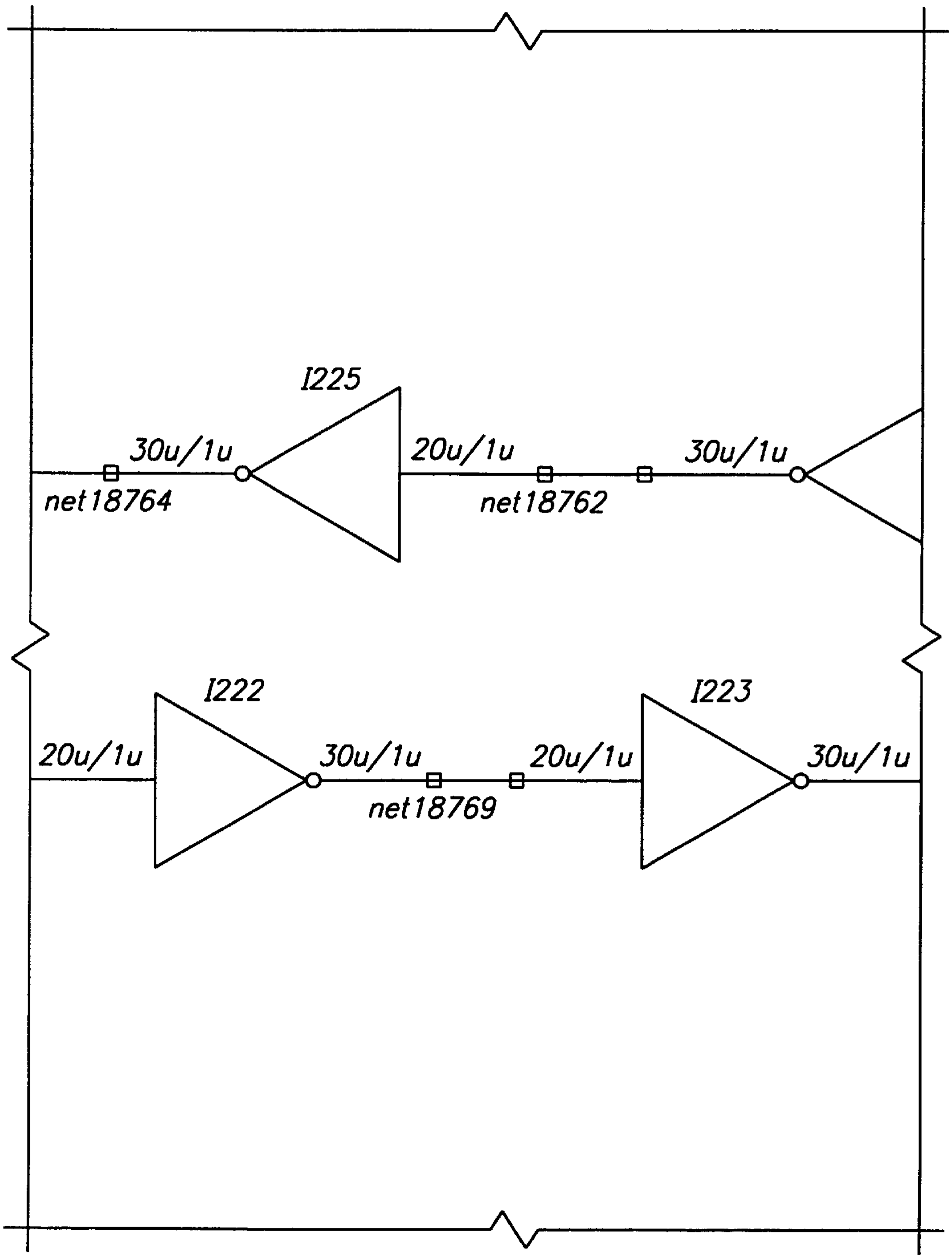
FIG 7.0102CI

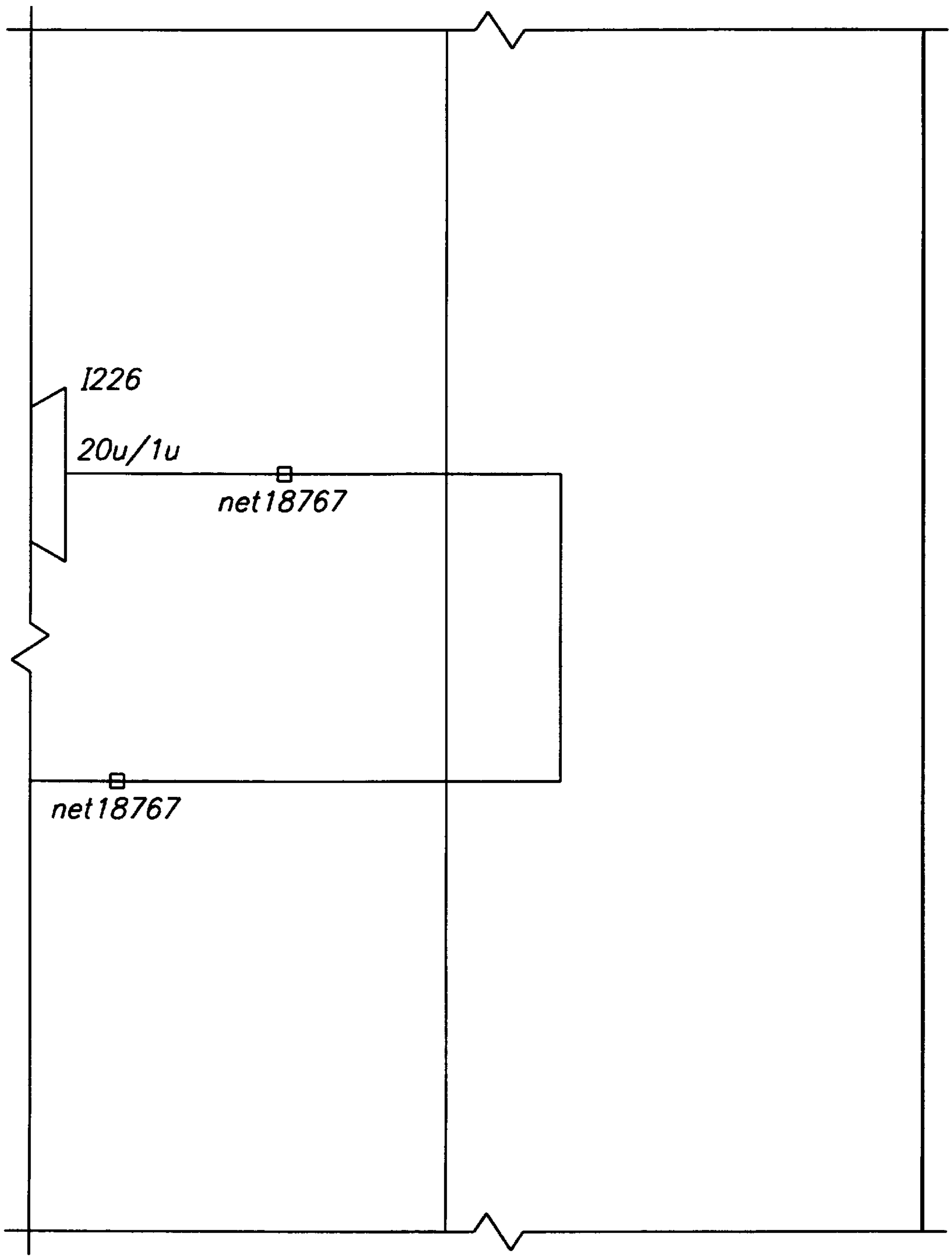
Fig 1.0102Cd

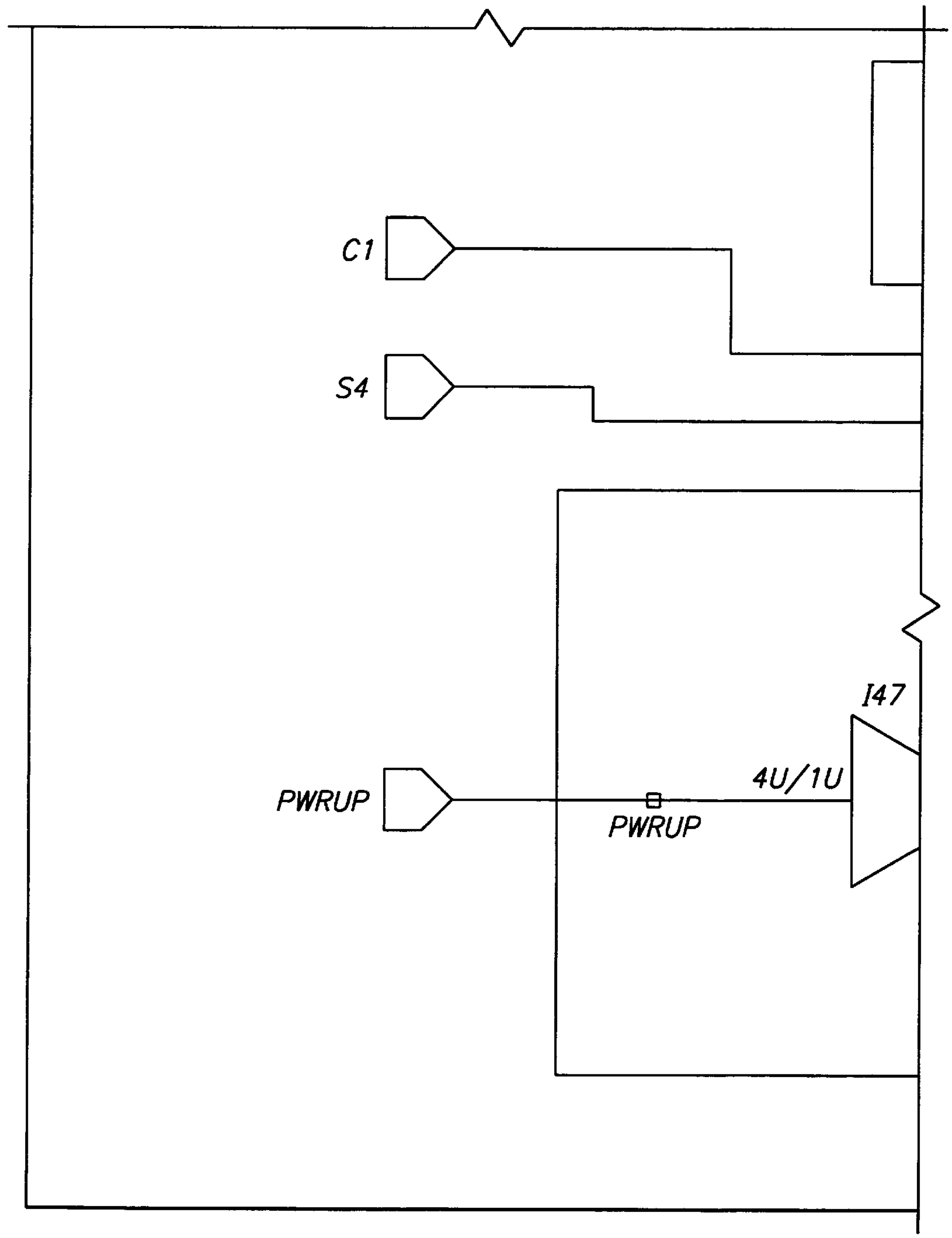
Fig 1.0102DA

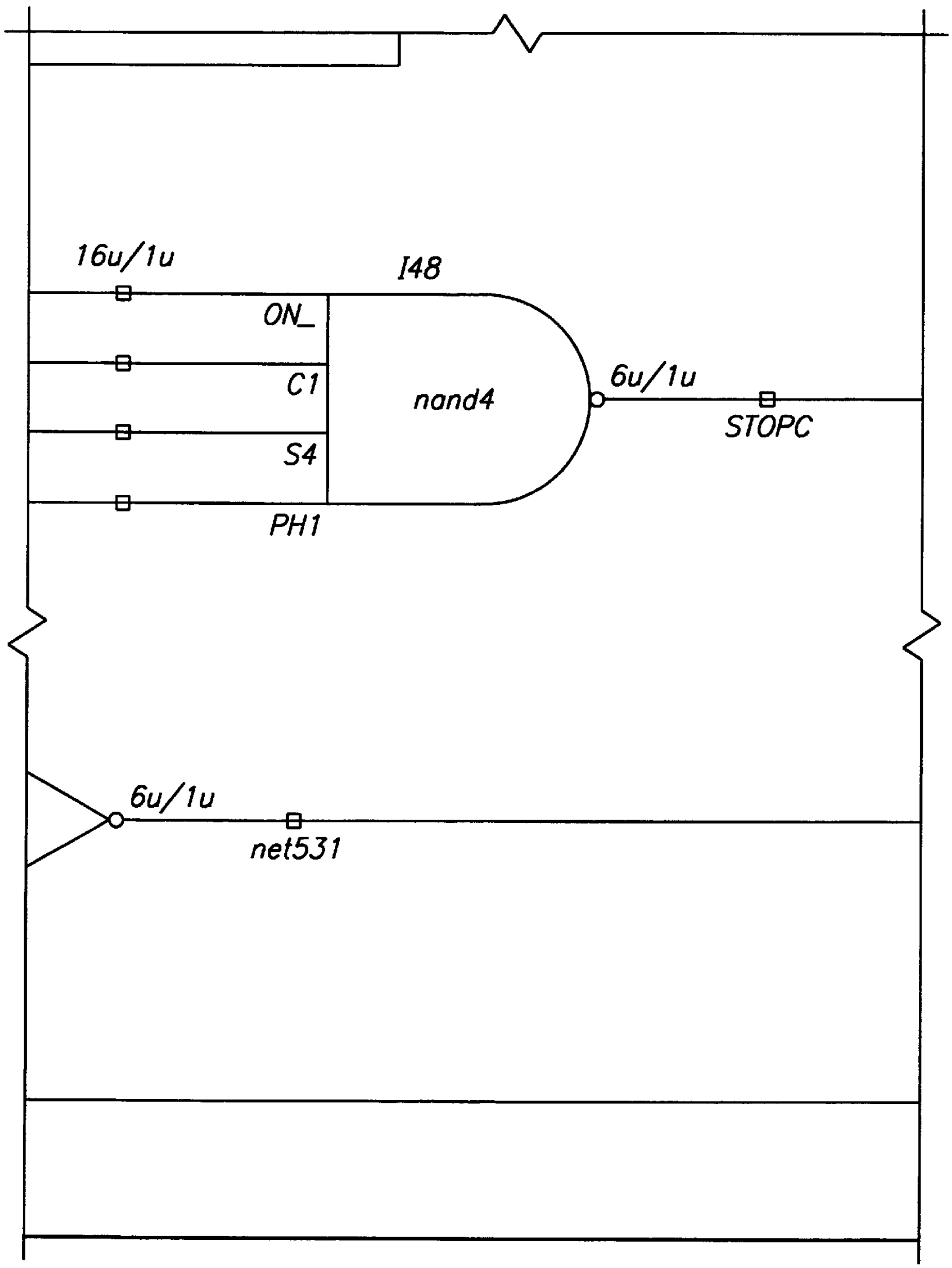
Fig 7.0102DB

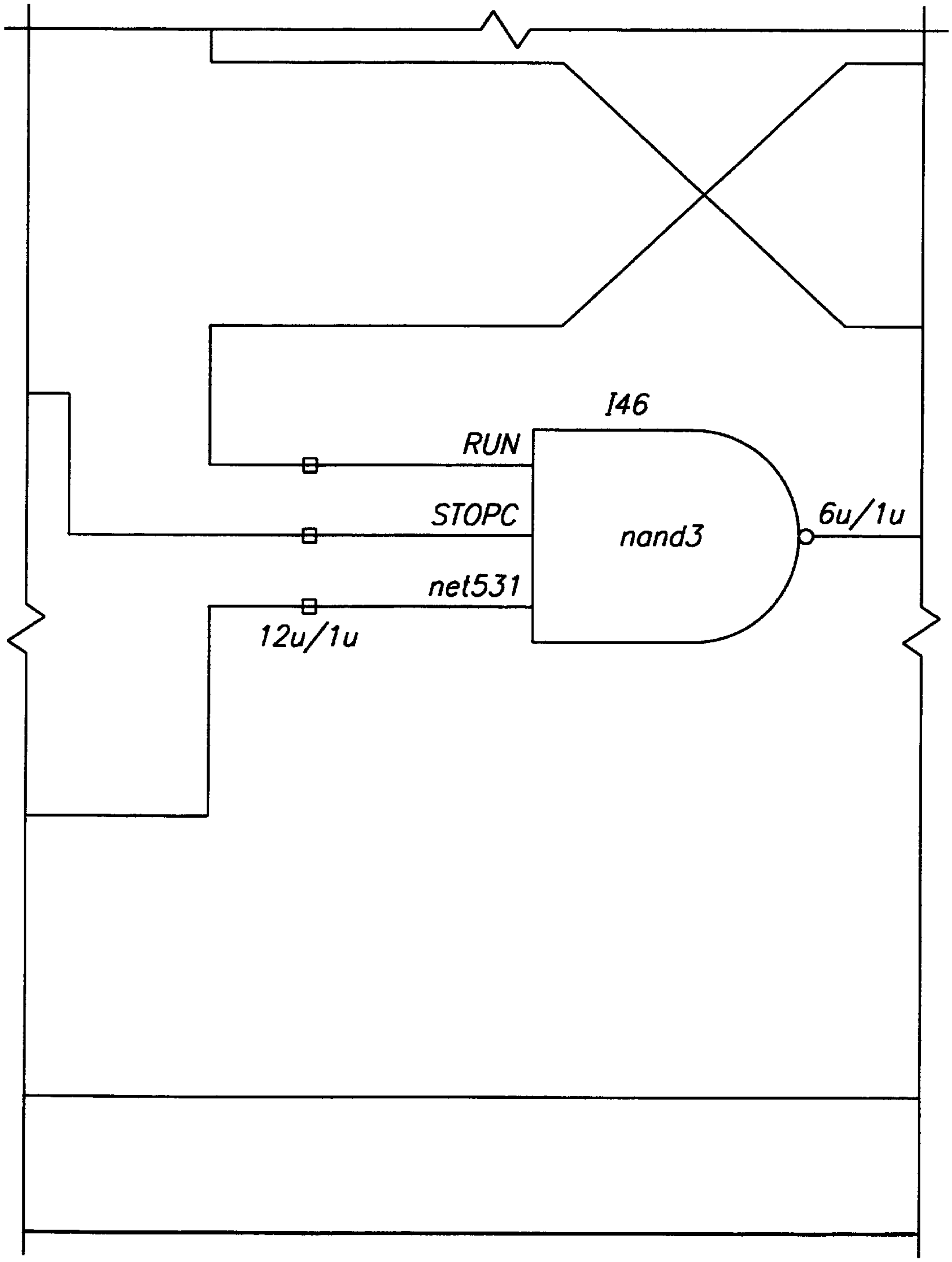
Fig 7.0102DC

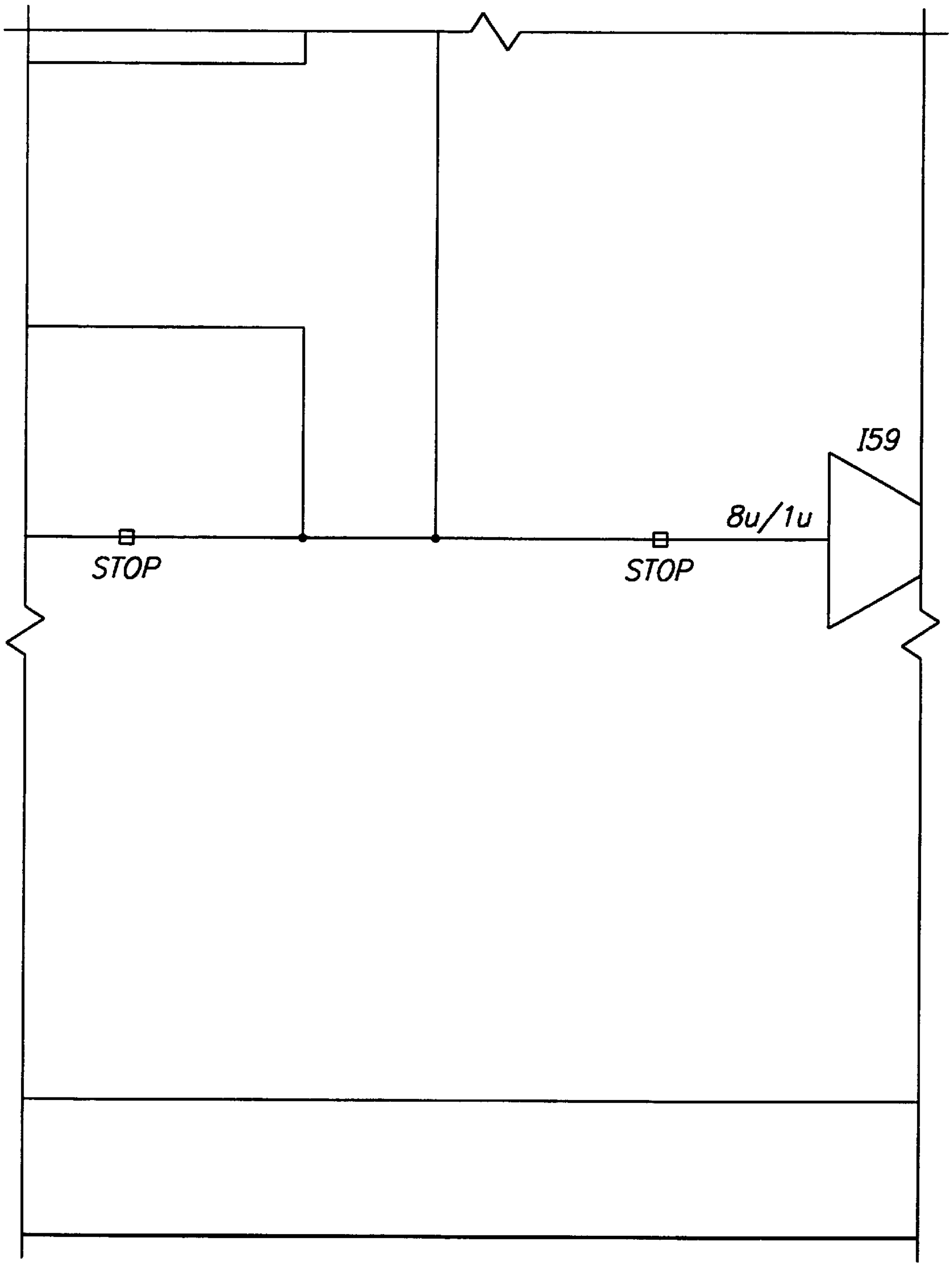
FIG. 7.0102DD

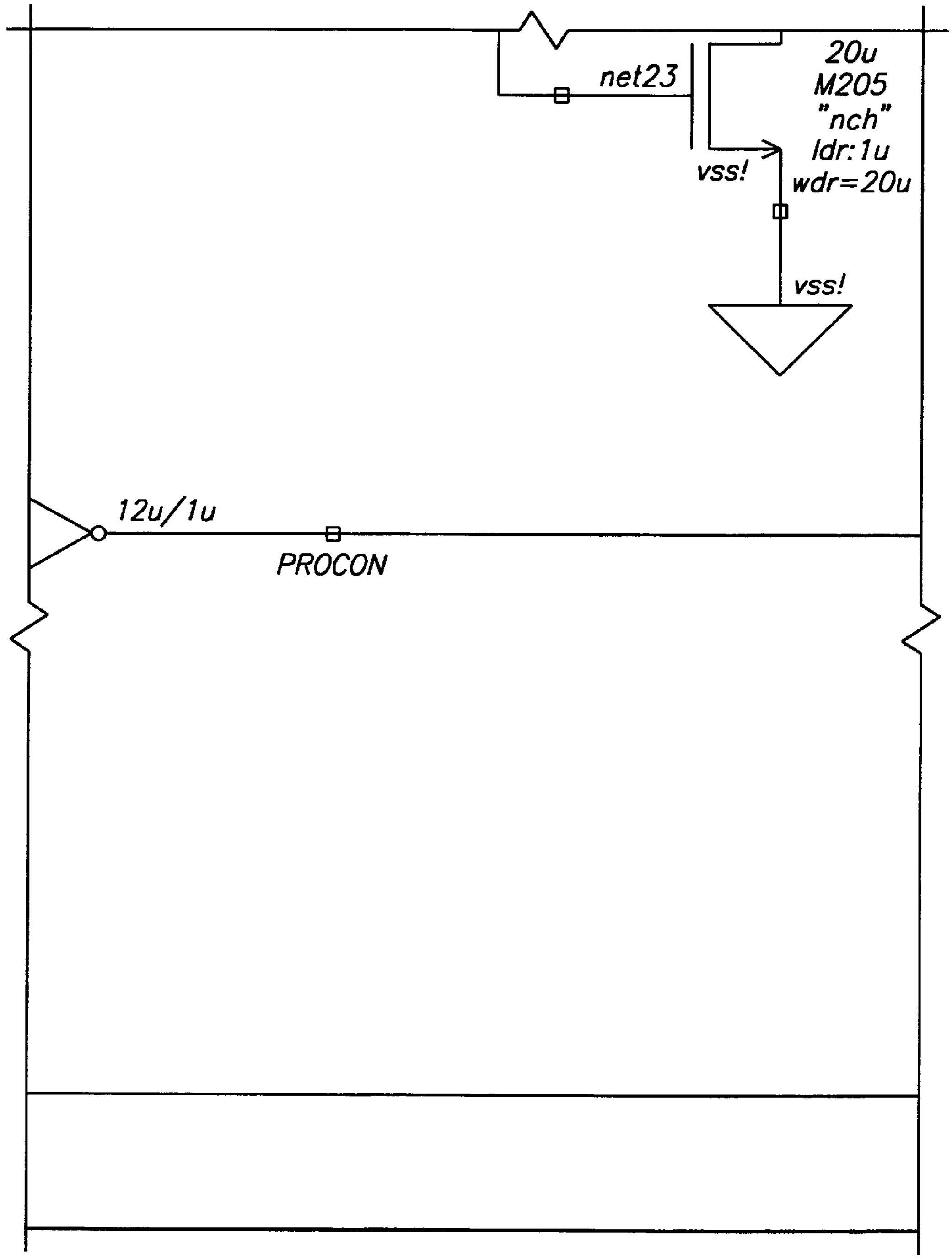
Fig 7.0102DE

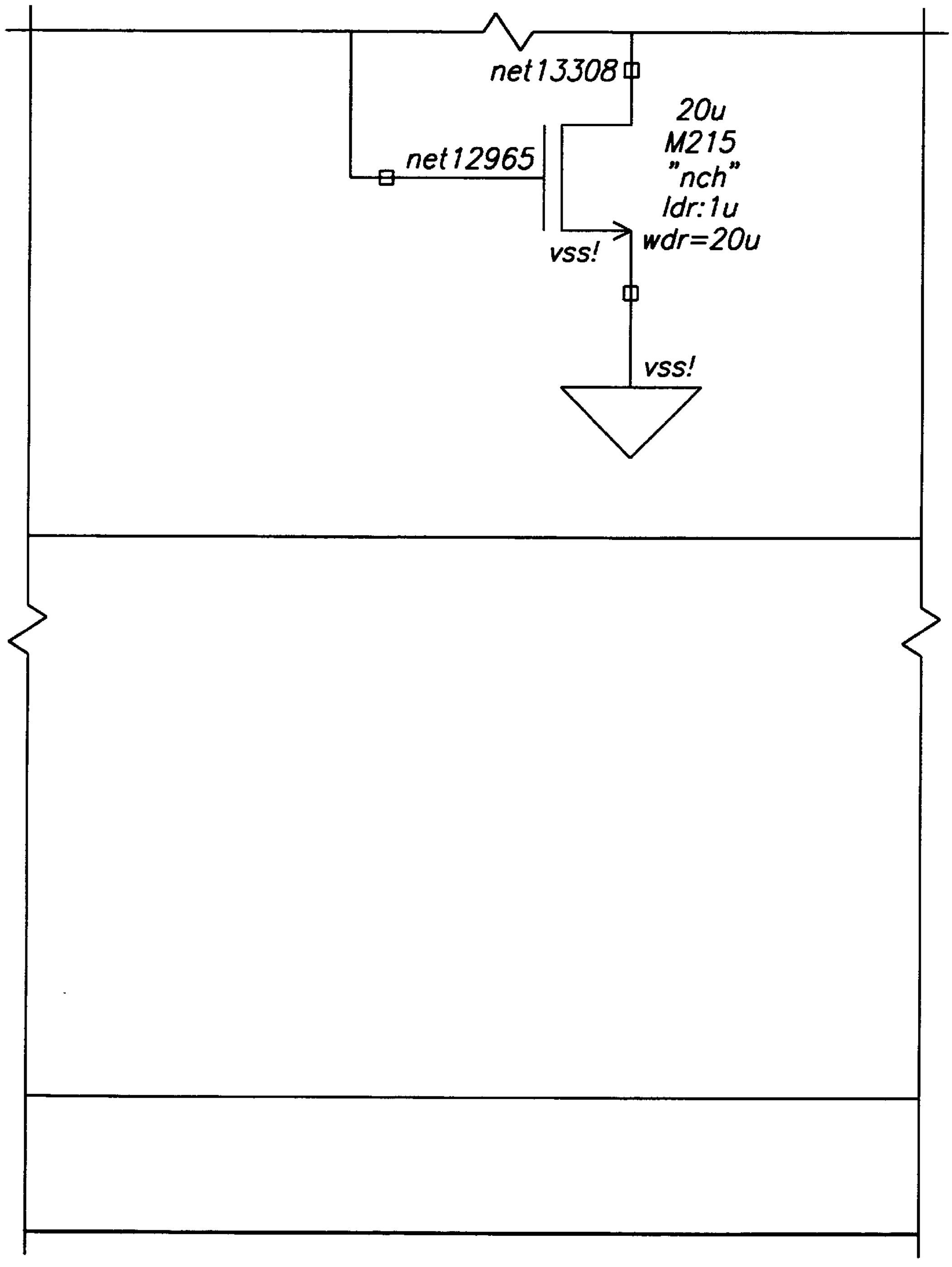
Fig 7.0102DF

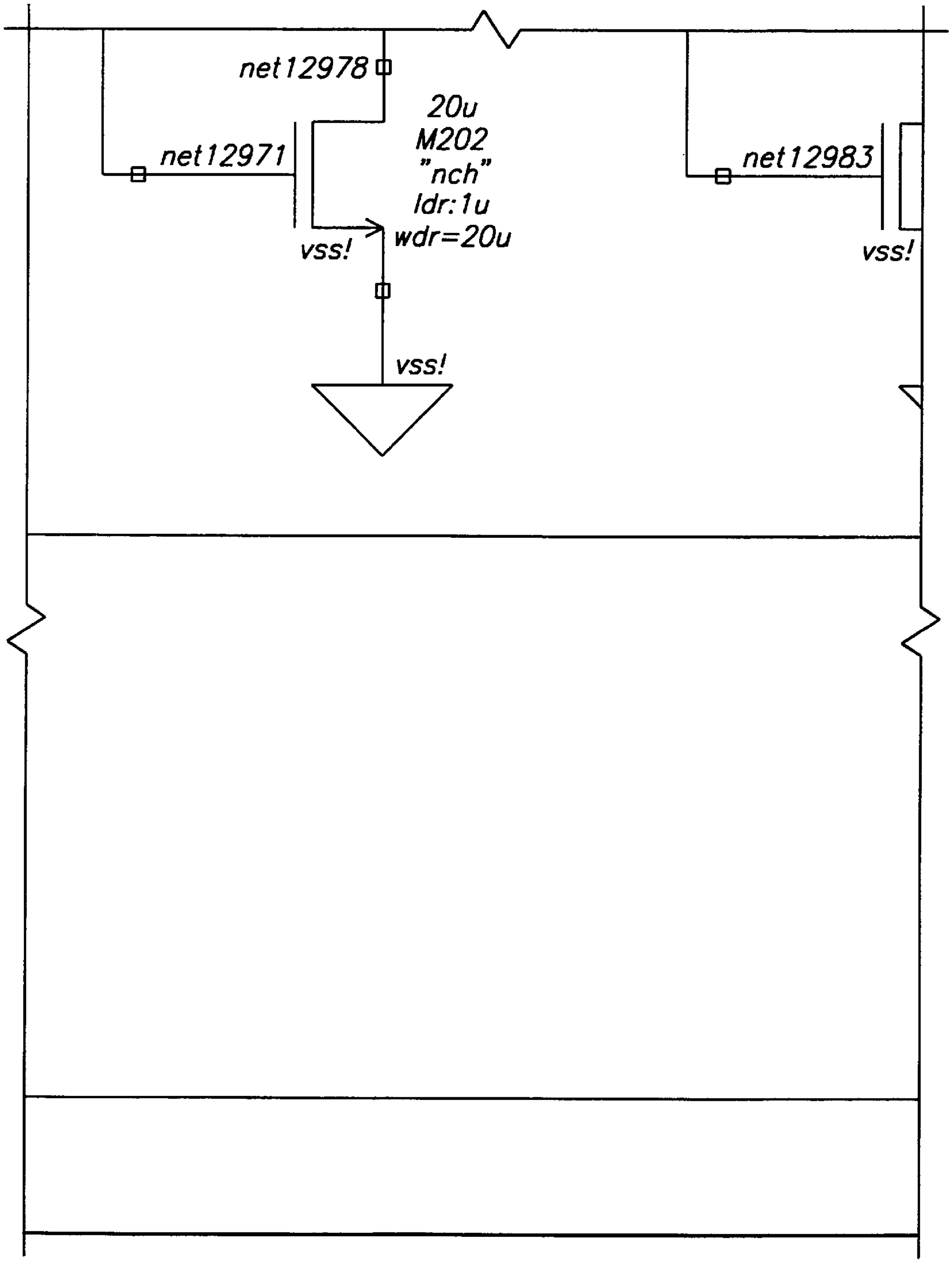
Fig 7.0102DG

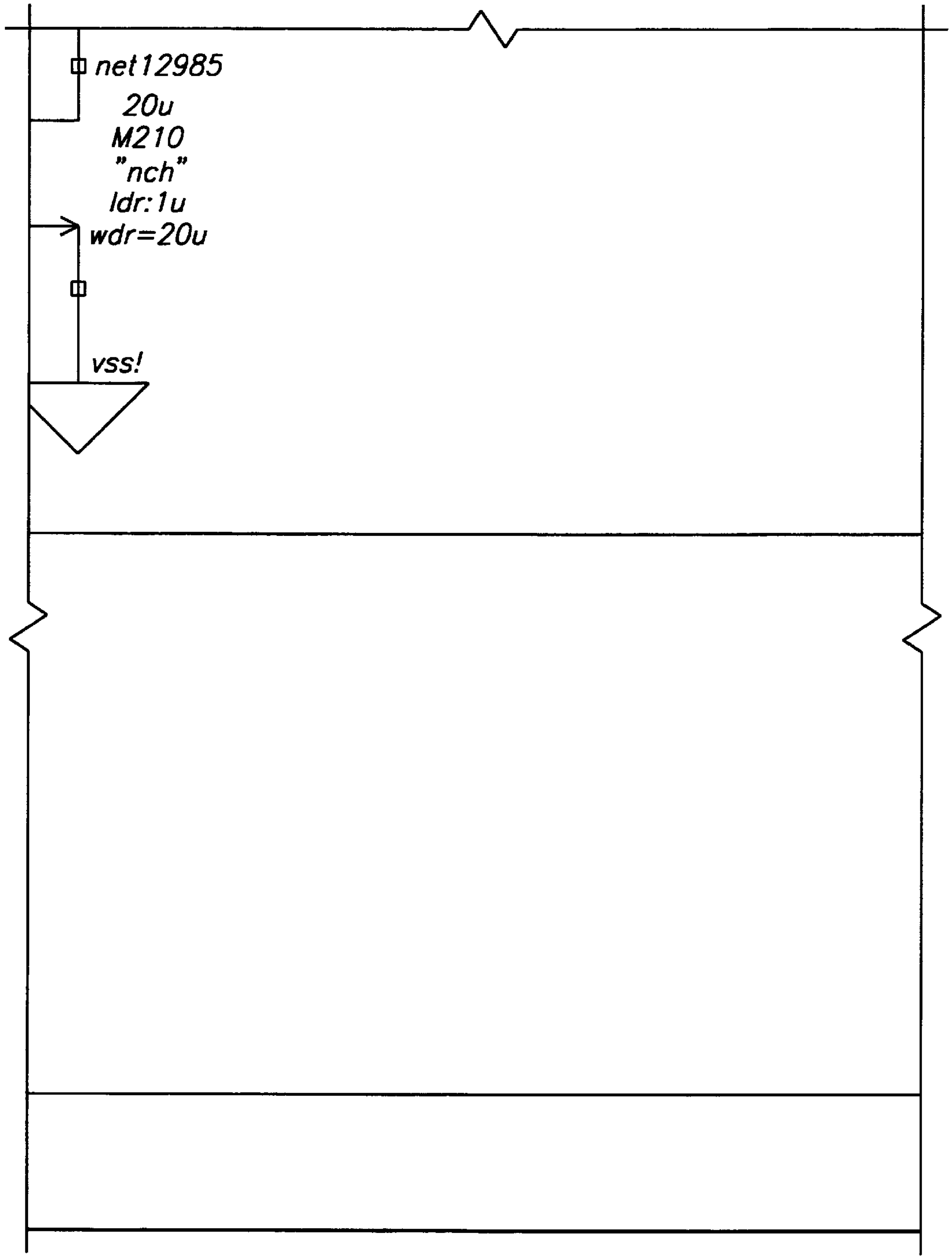
Fig 7.0102DH

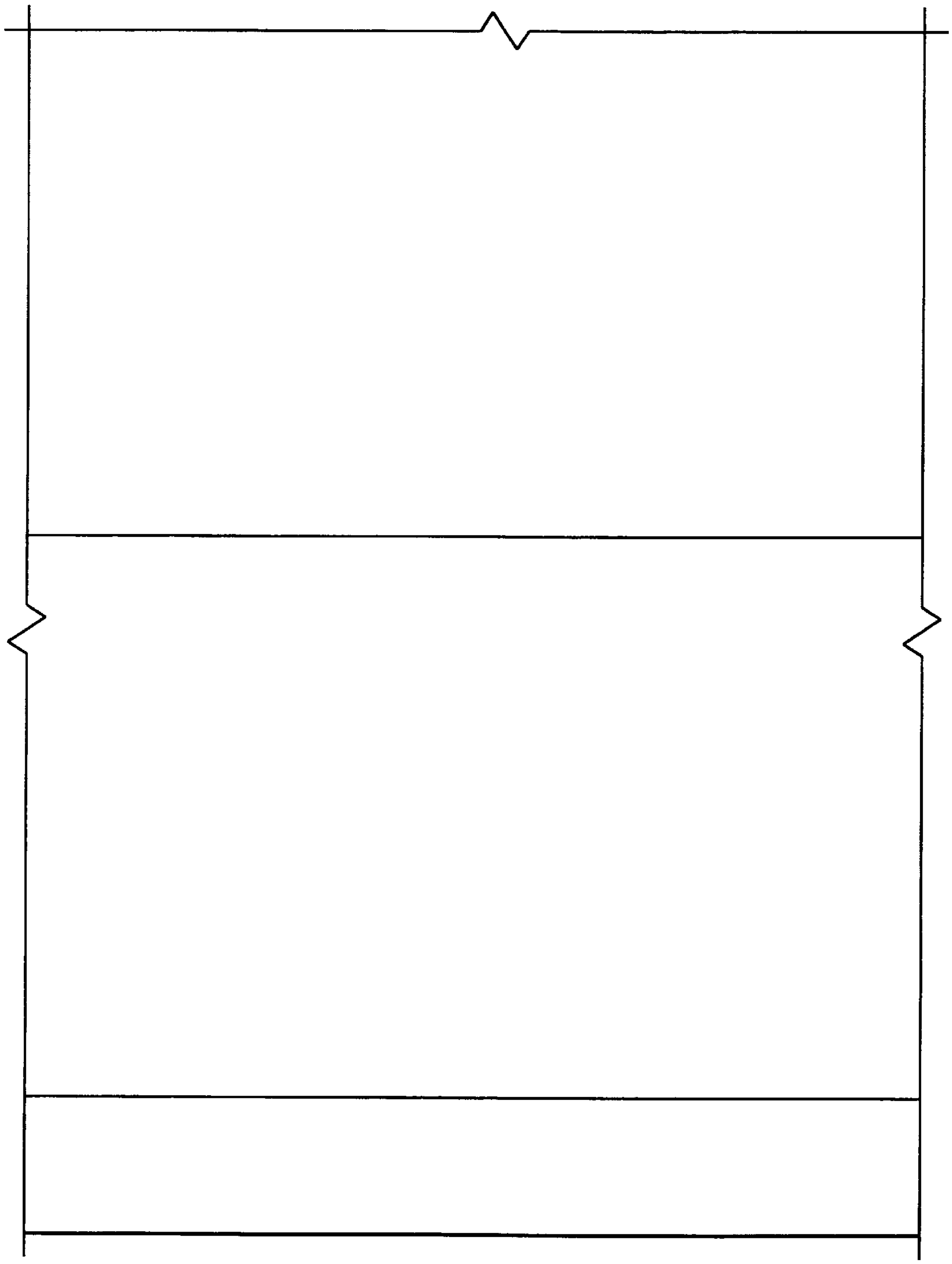
FIG. 7.0102DI

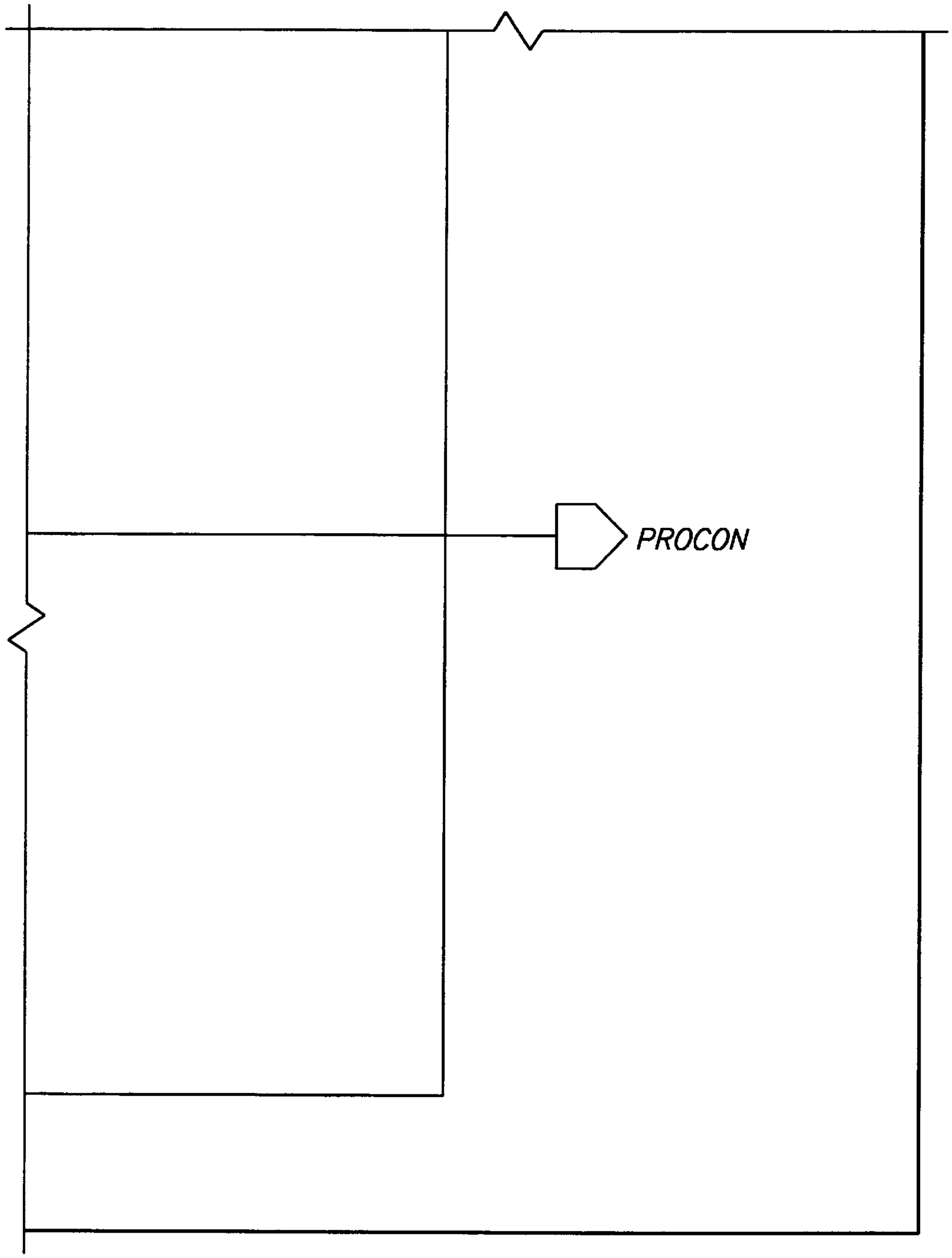
Fig 1.0102DJ

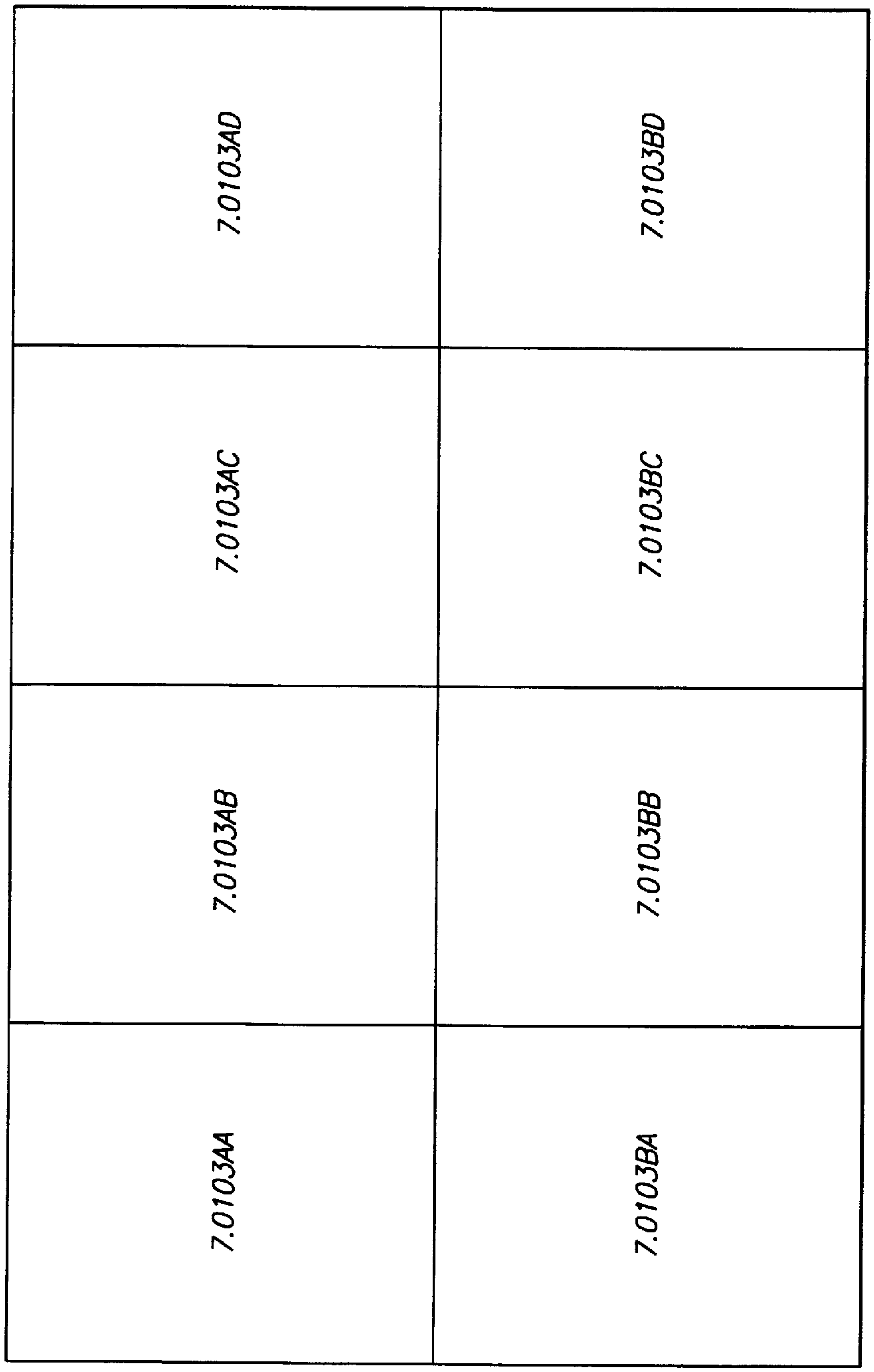
FIG. 7.0103

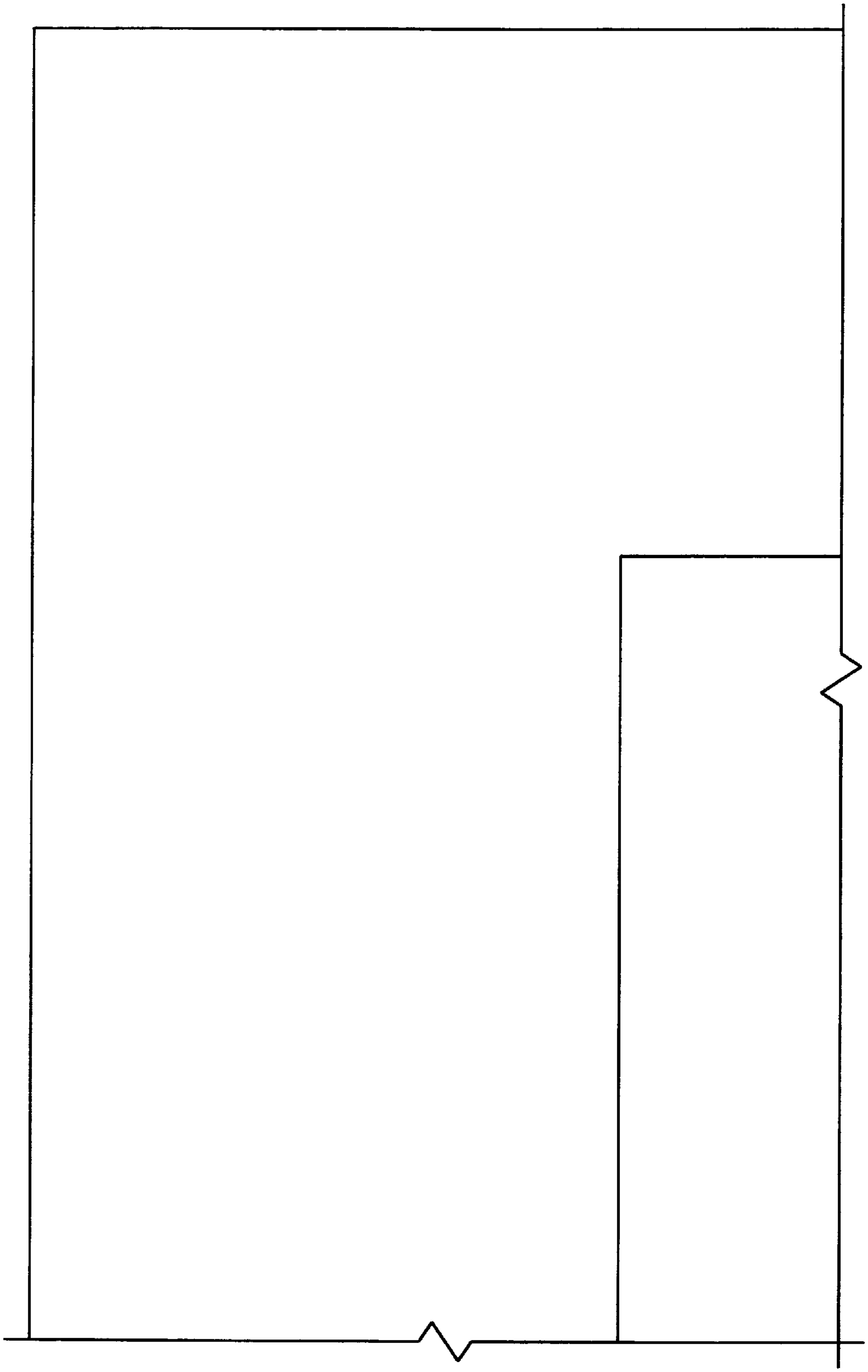
Fig. 7.0103AA

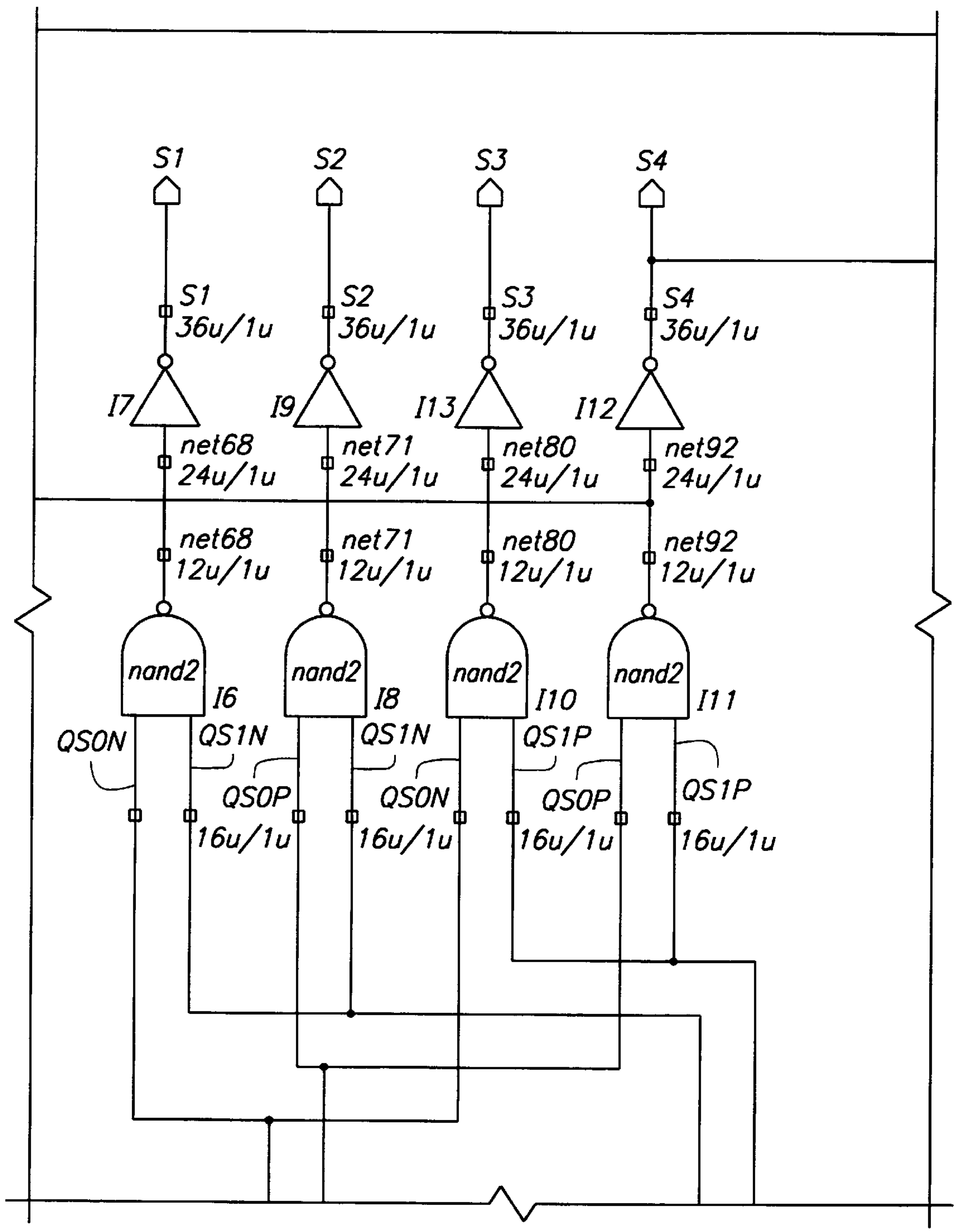
Fig. 7.0103AB

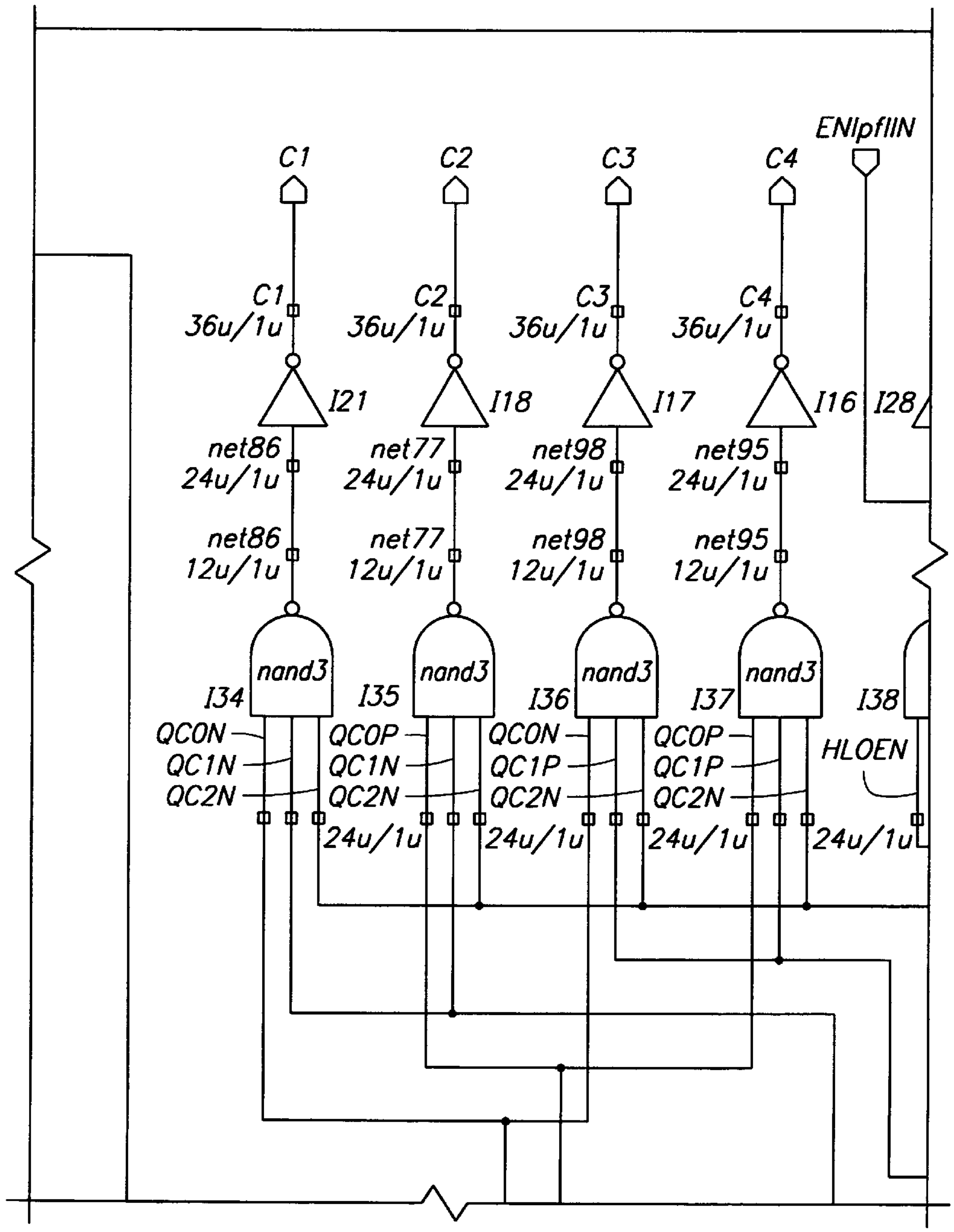
Fig 7.0103AC

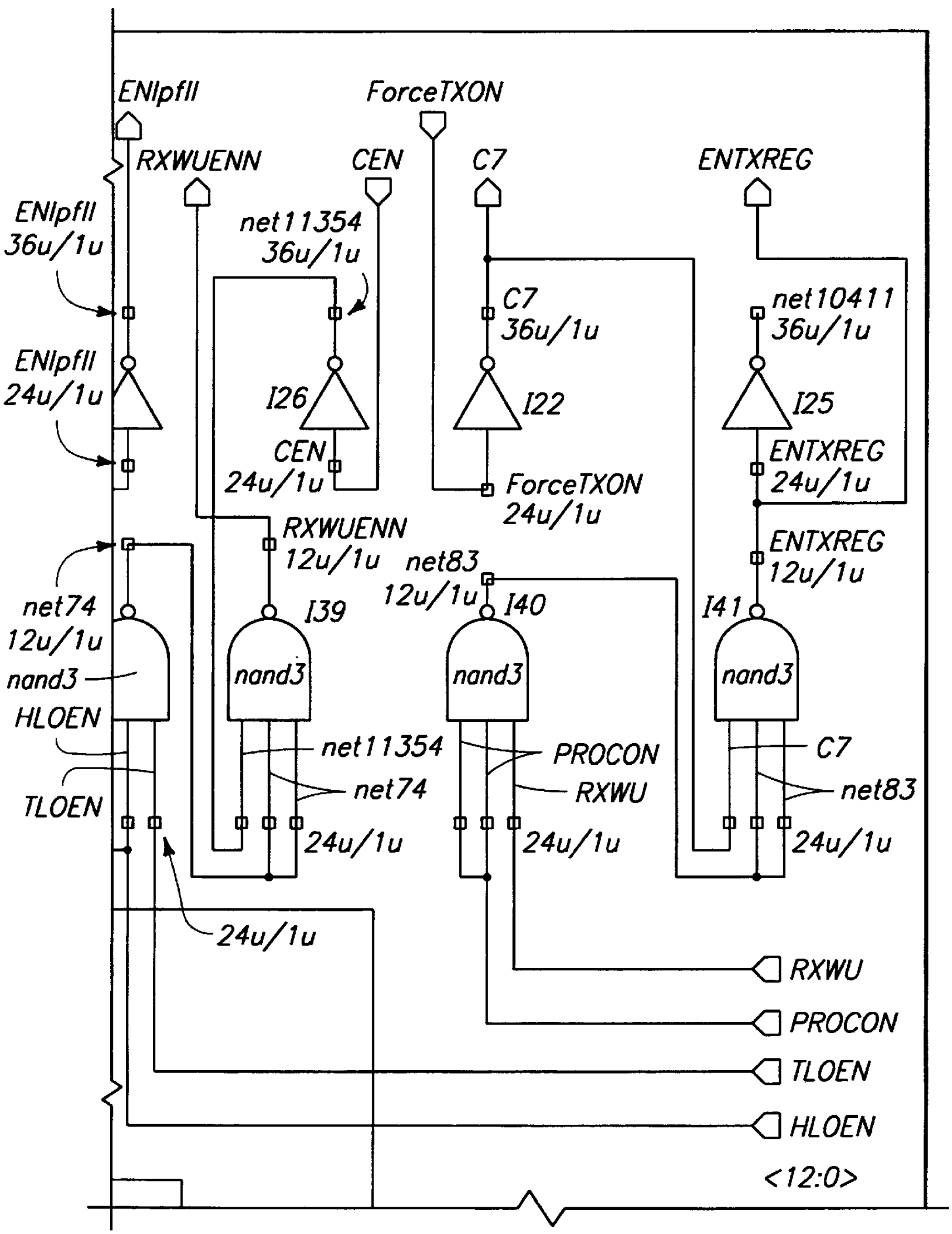
Fig. 7.0103AD

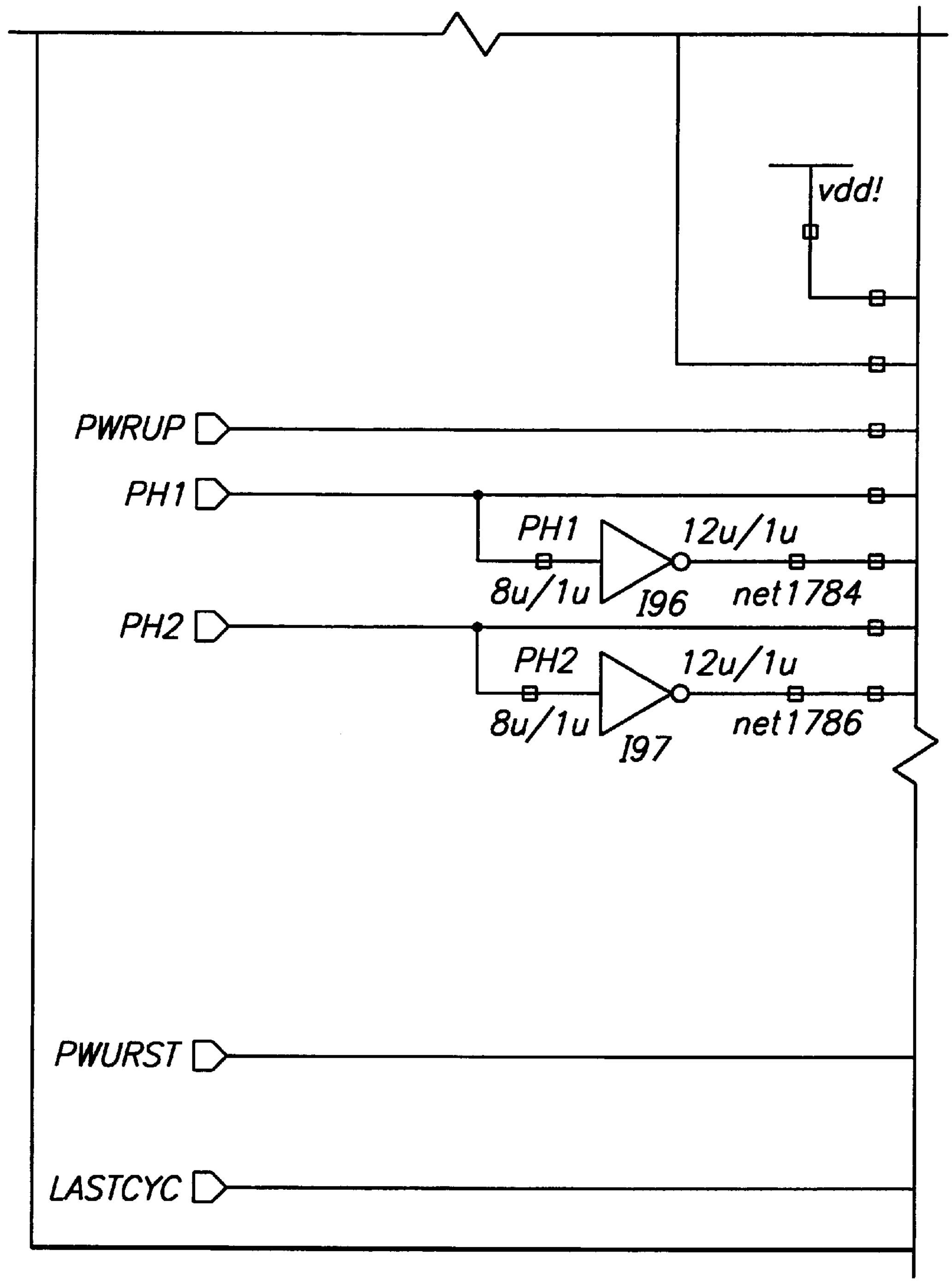
Fig 7.0103BA

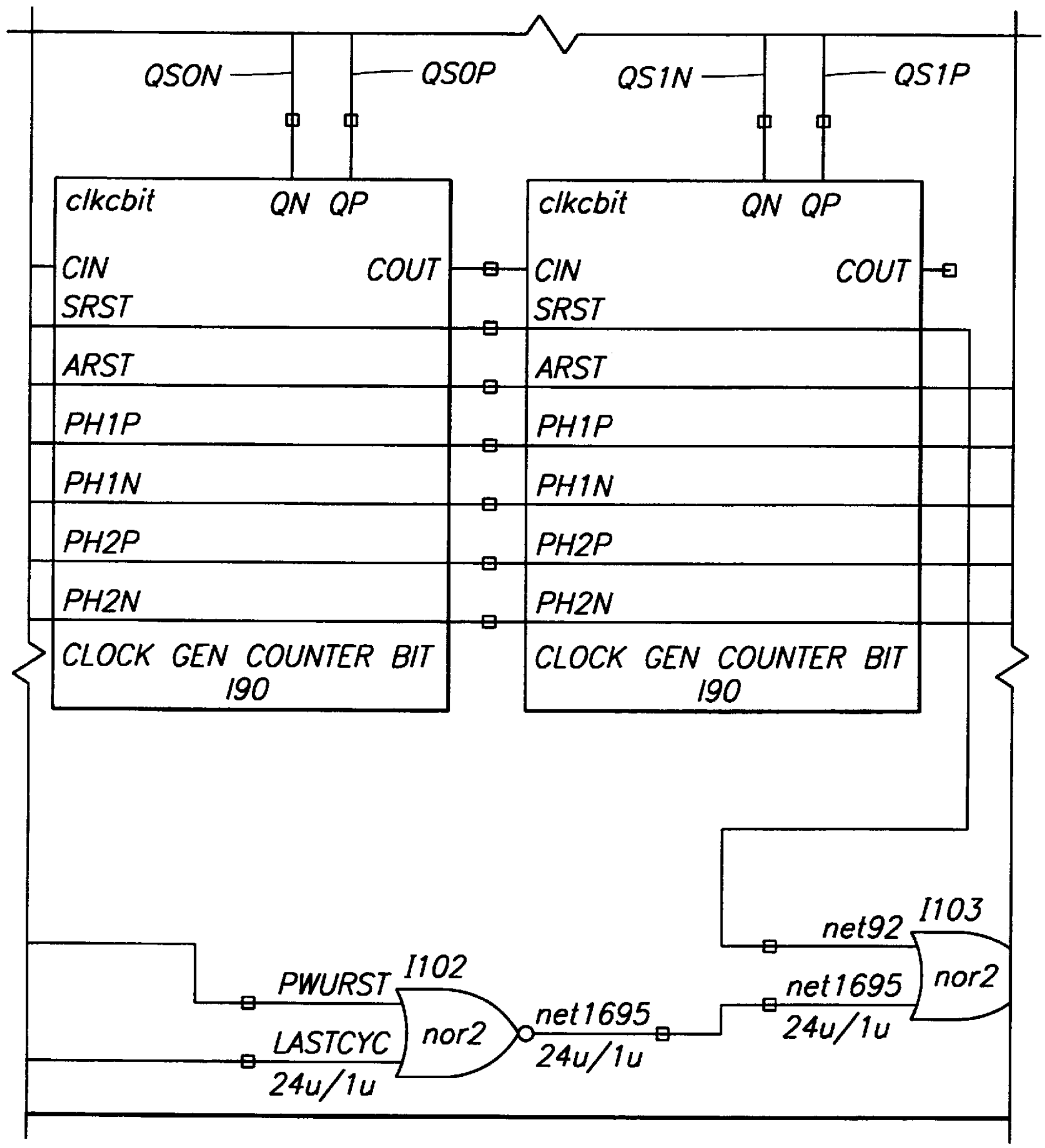
Fig 1.01.03BB

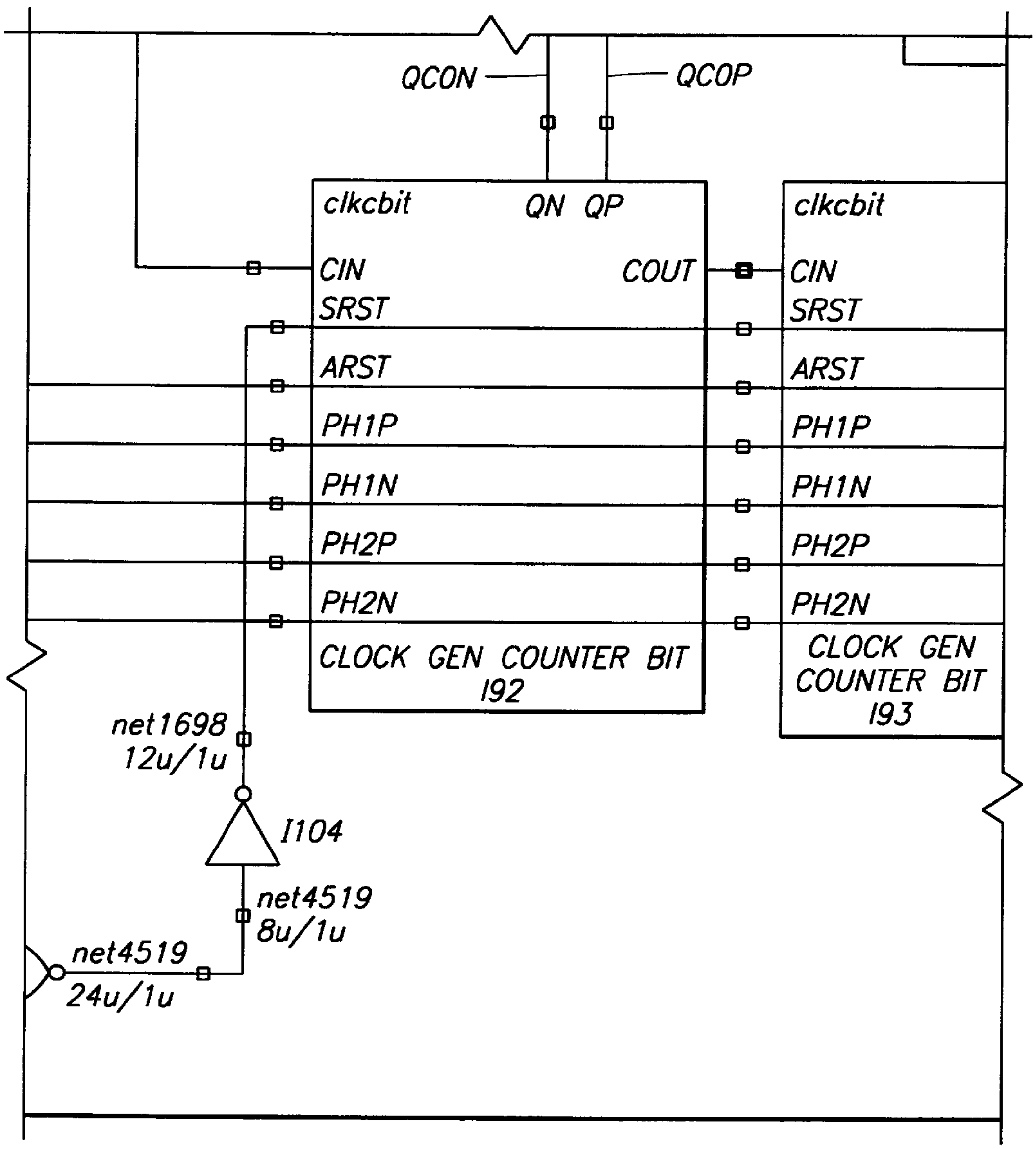
Fig. 7.01103BC

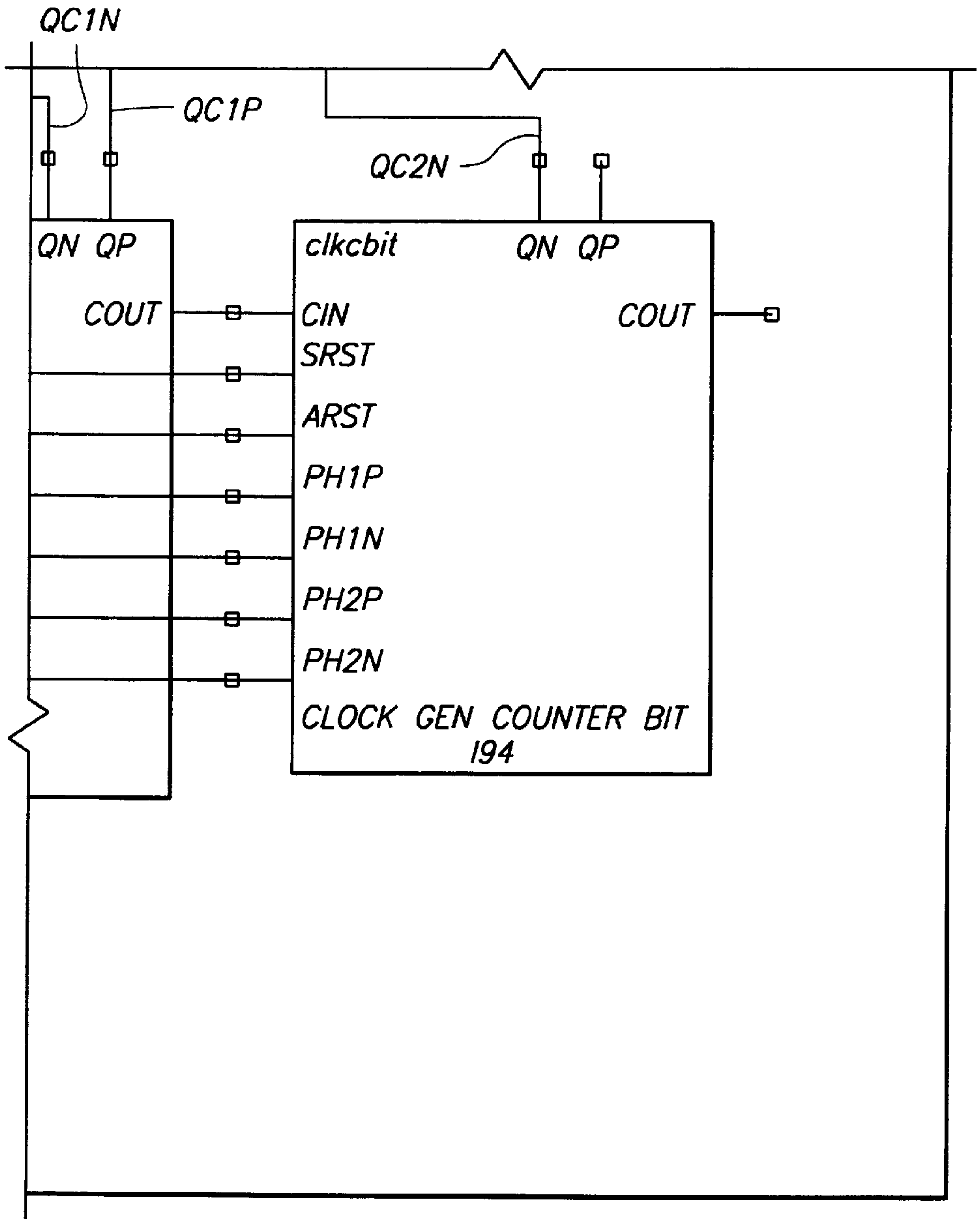
FIG. 1.0103BD

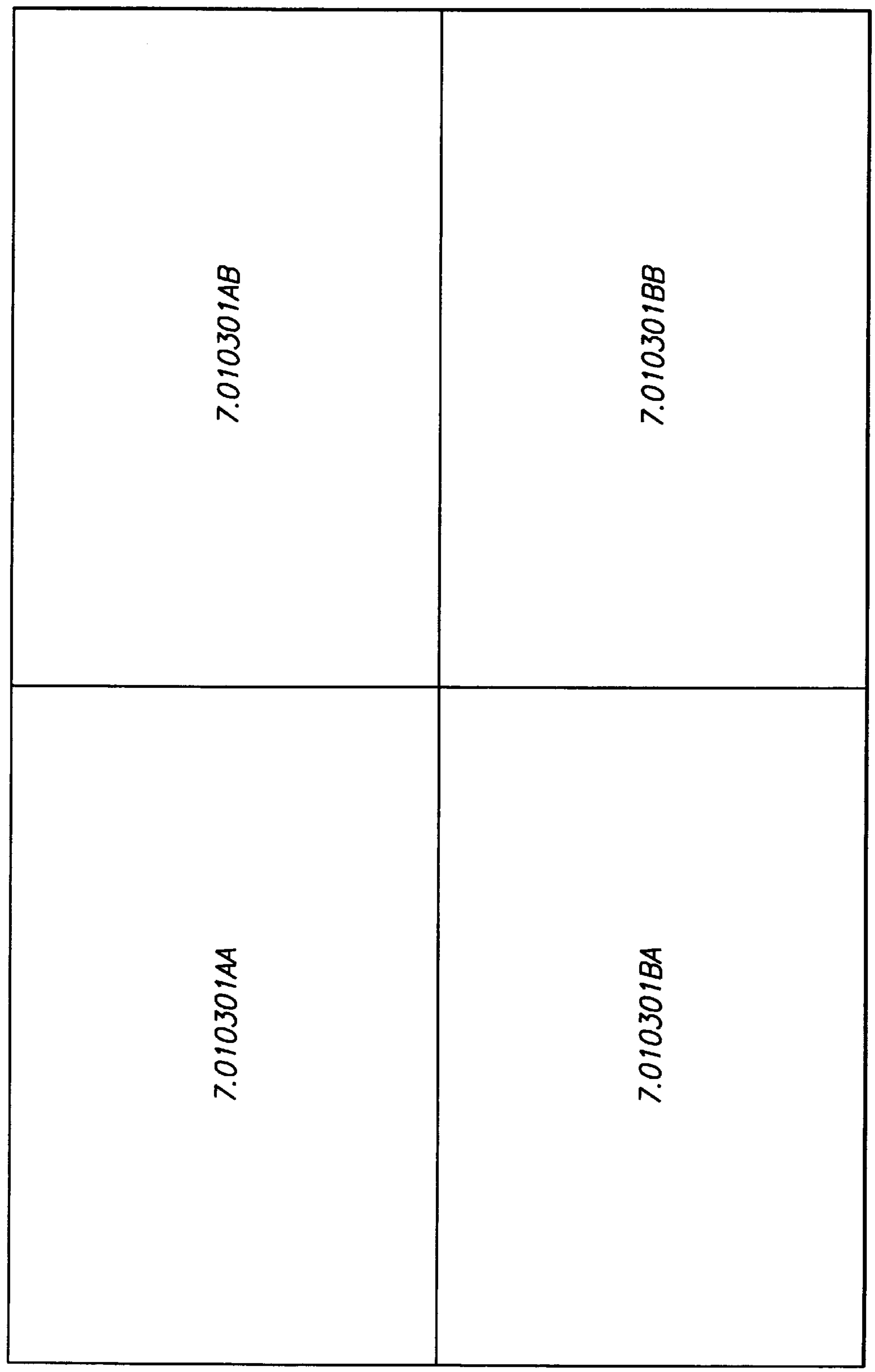
FIG. 7.010301

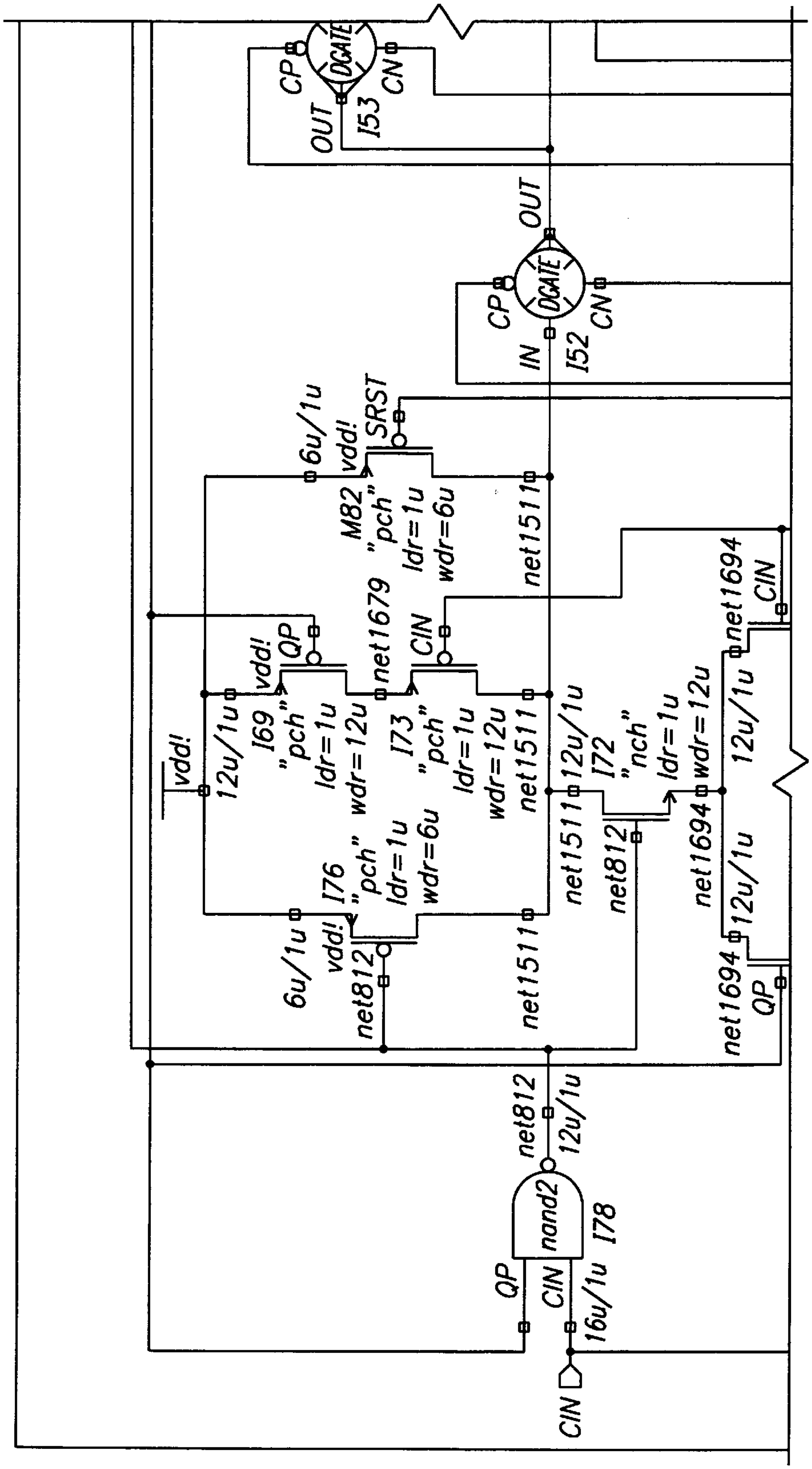
FIG. 7.0.10AA

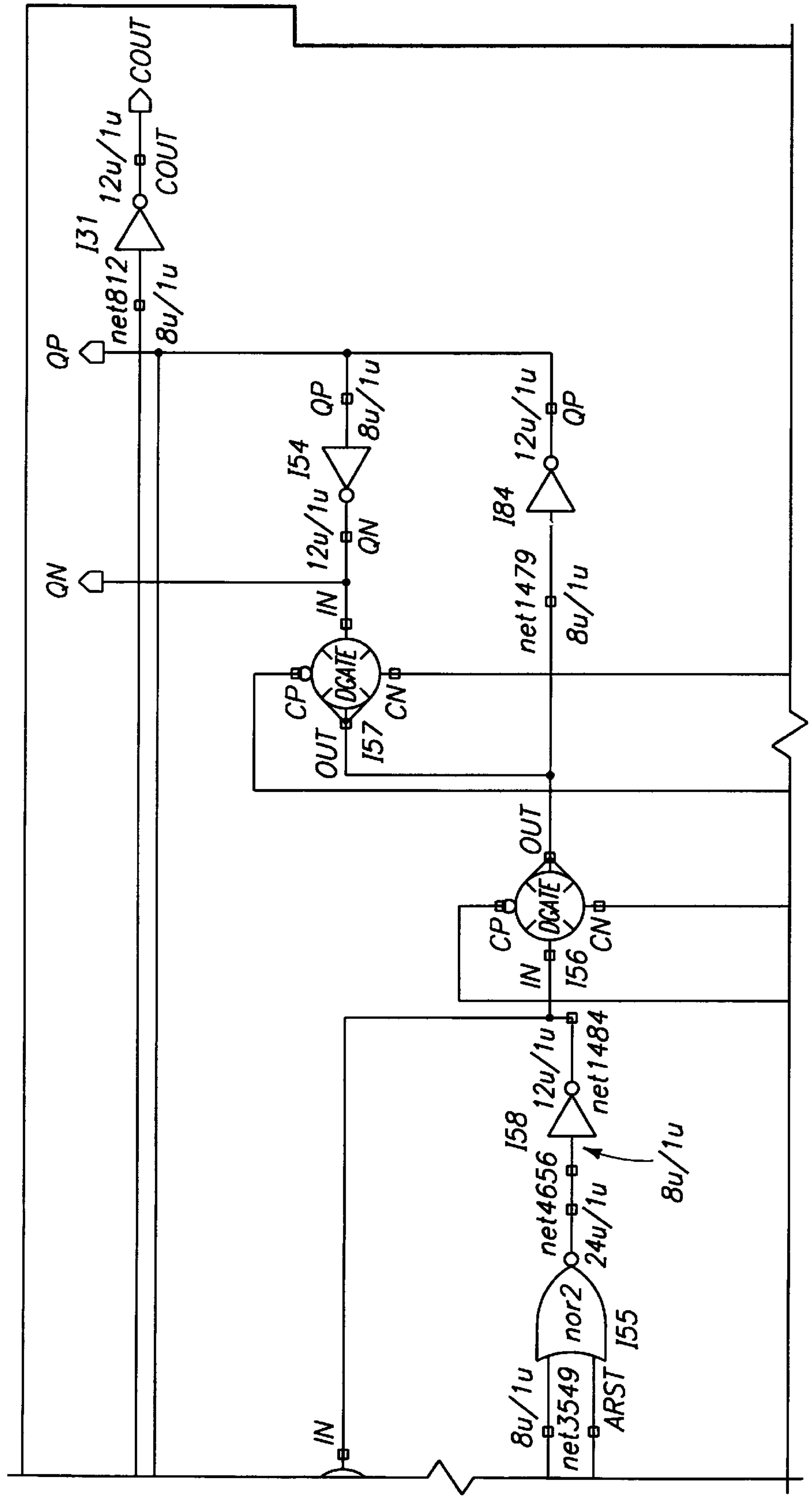
FIG. 7.10E10.4B

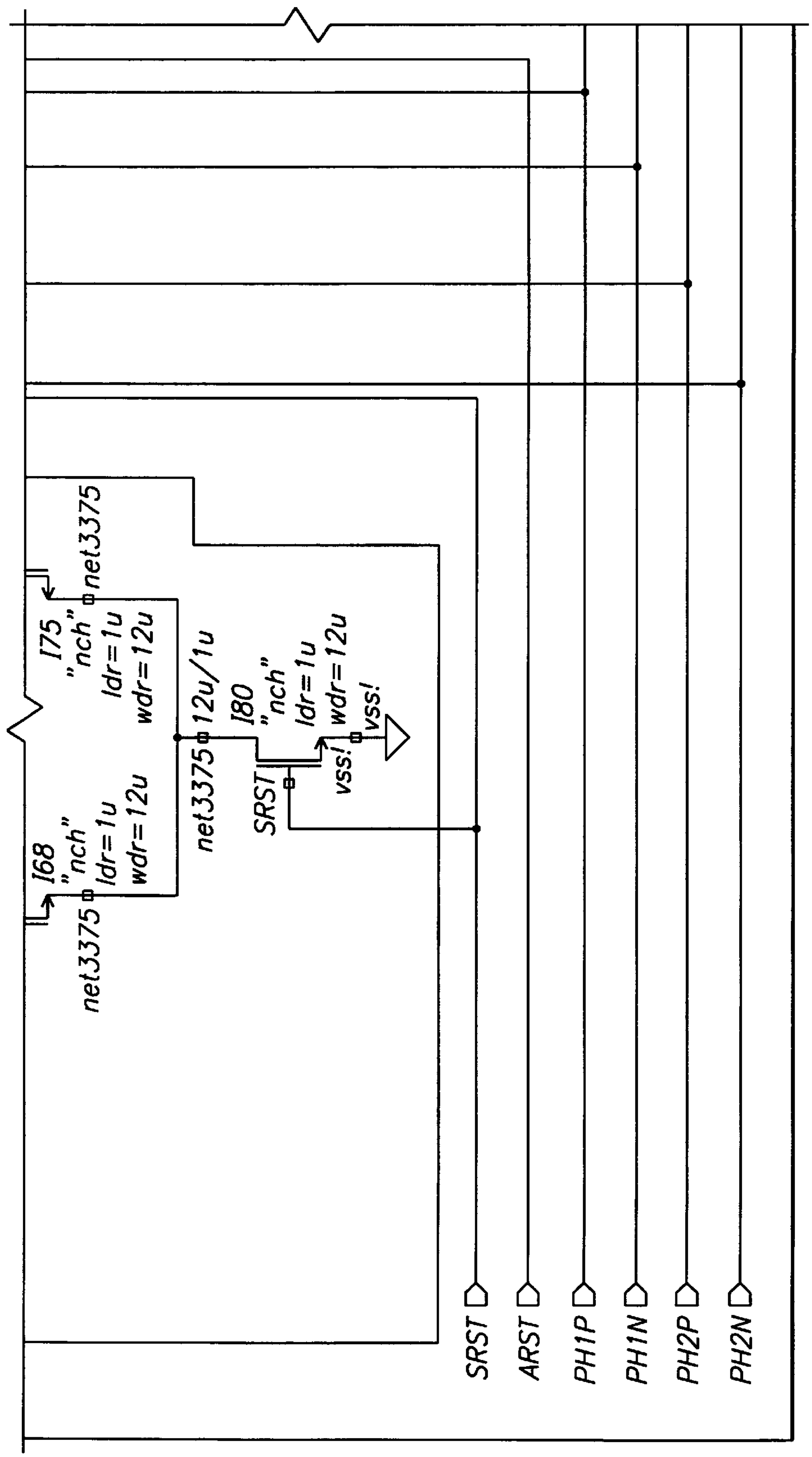
FIG. 7.0103018A

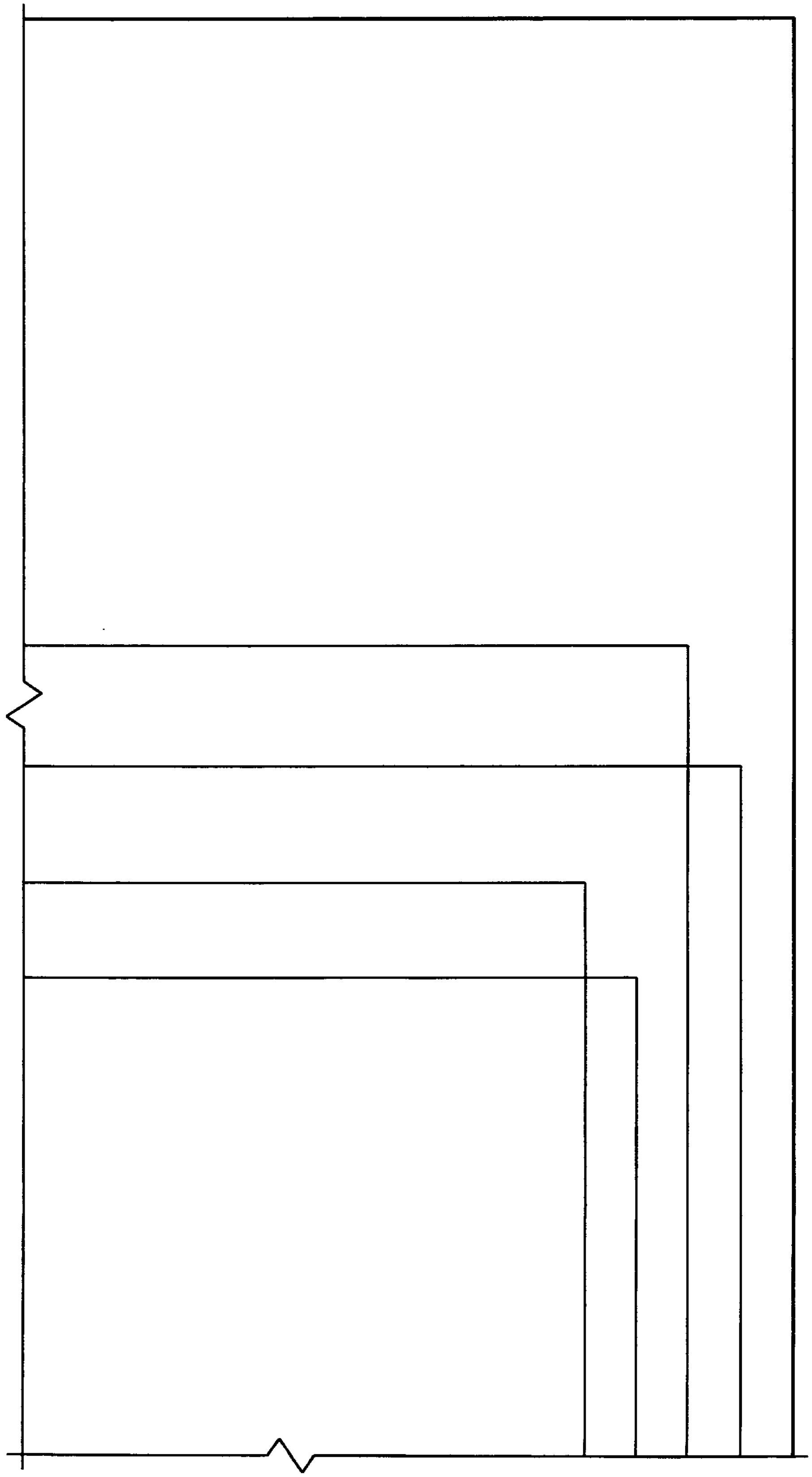
FIG. 1.D1DE188

| | | | | | |
|---|---|---|---|---|---|
| 7.02AA | 7.02AB | 7.02AC | 7.02AD | 7.02AE | 7.02AF |
| 7.02BA | 7.02BB | 7.02BC | 7.02BD | 7.02BE | 7.02BF |

Fig. 7.02

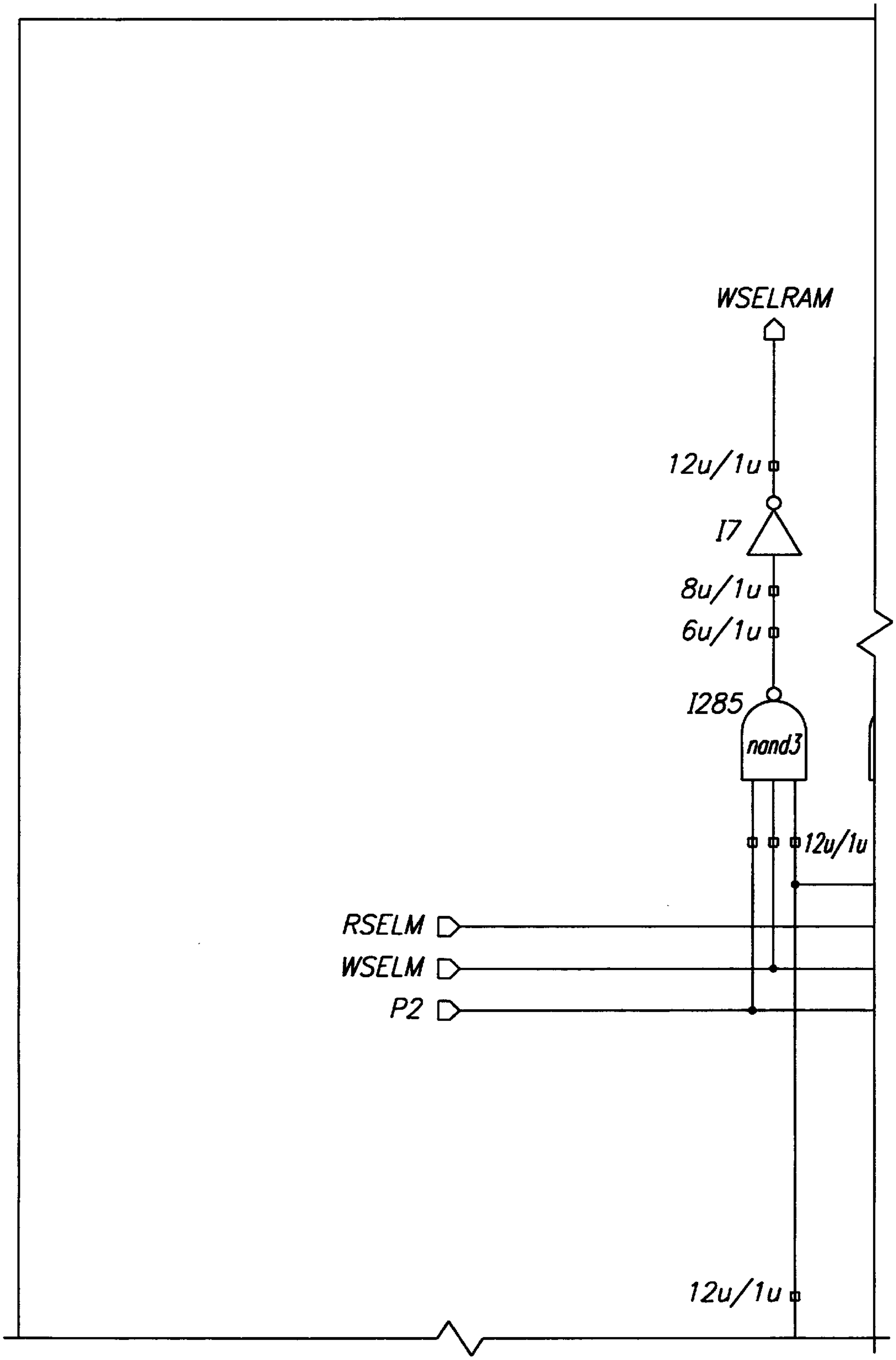
Fig 7.02AA

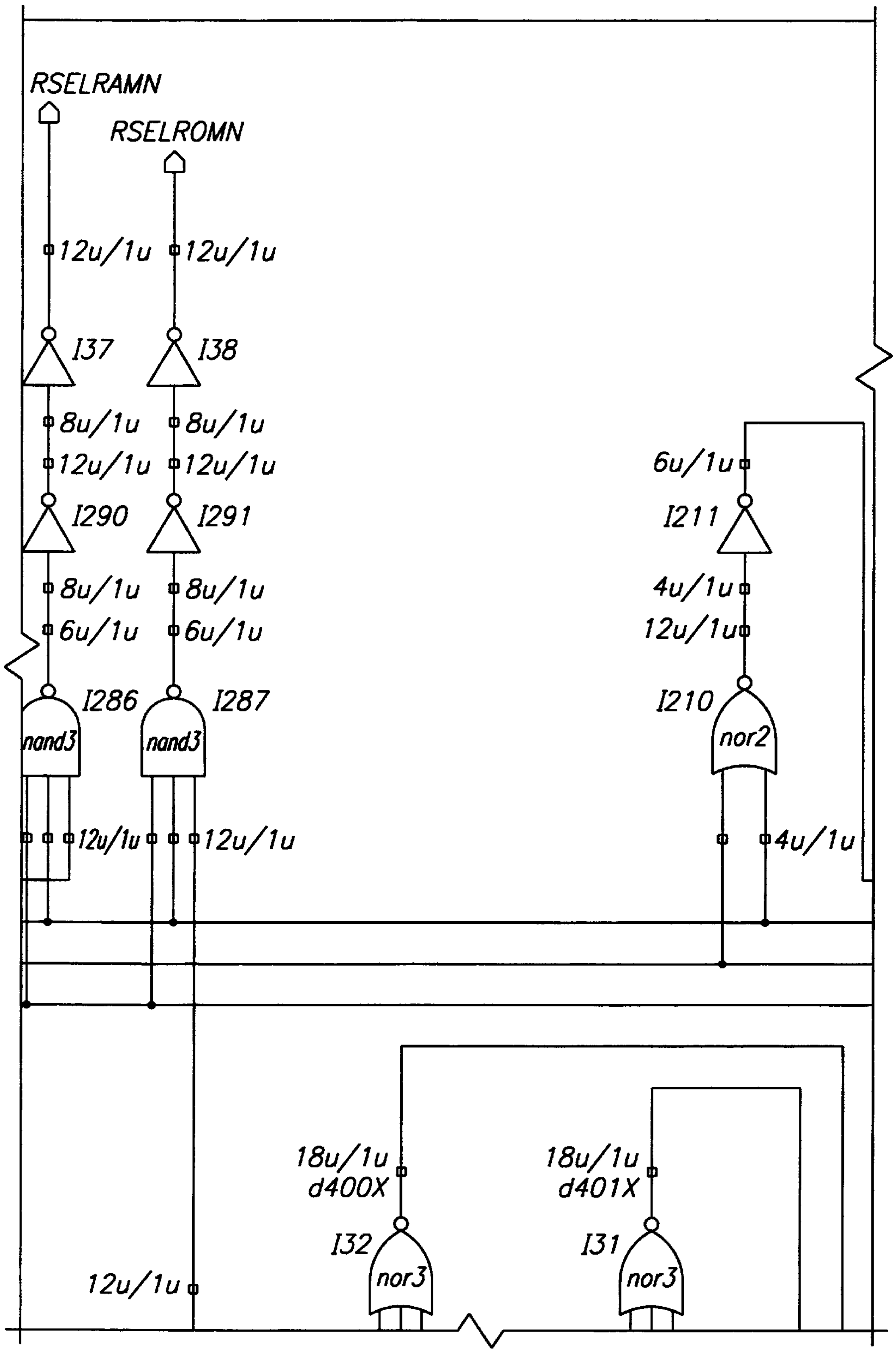
Fig 1.02AB

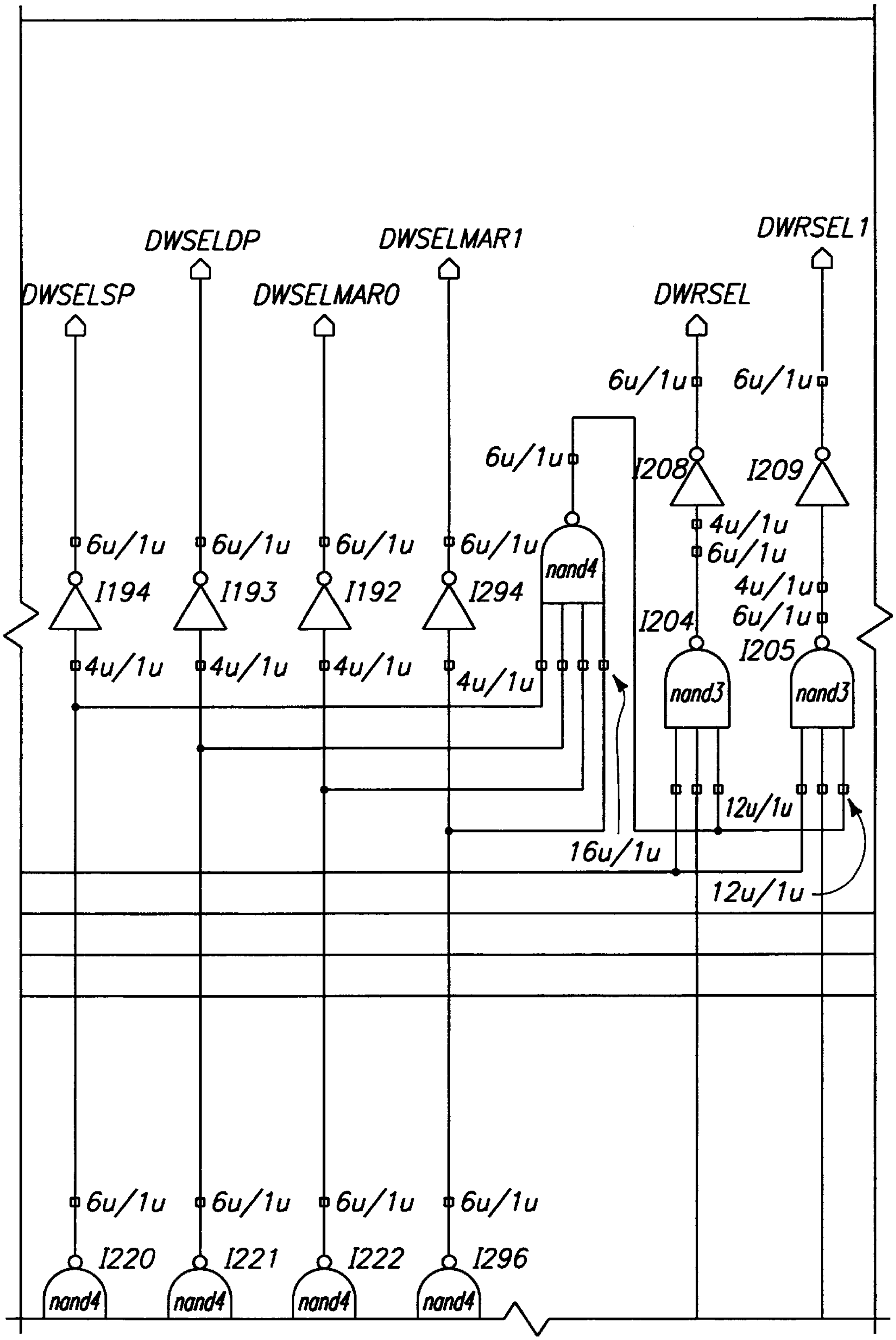
Fig 1.02AC

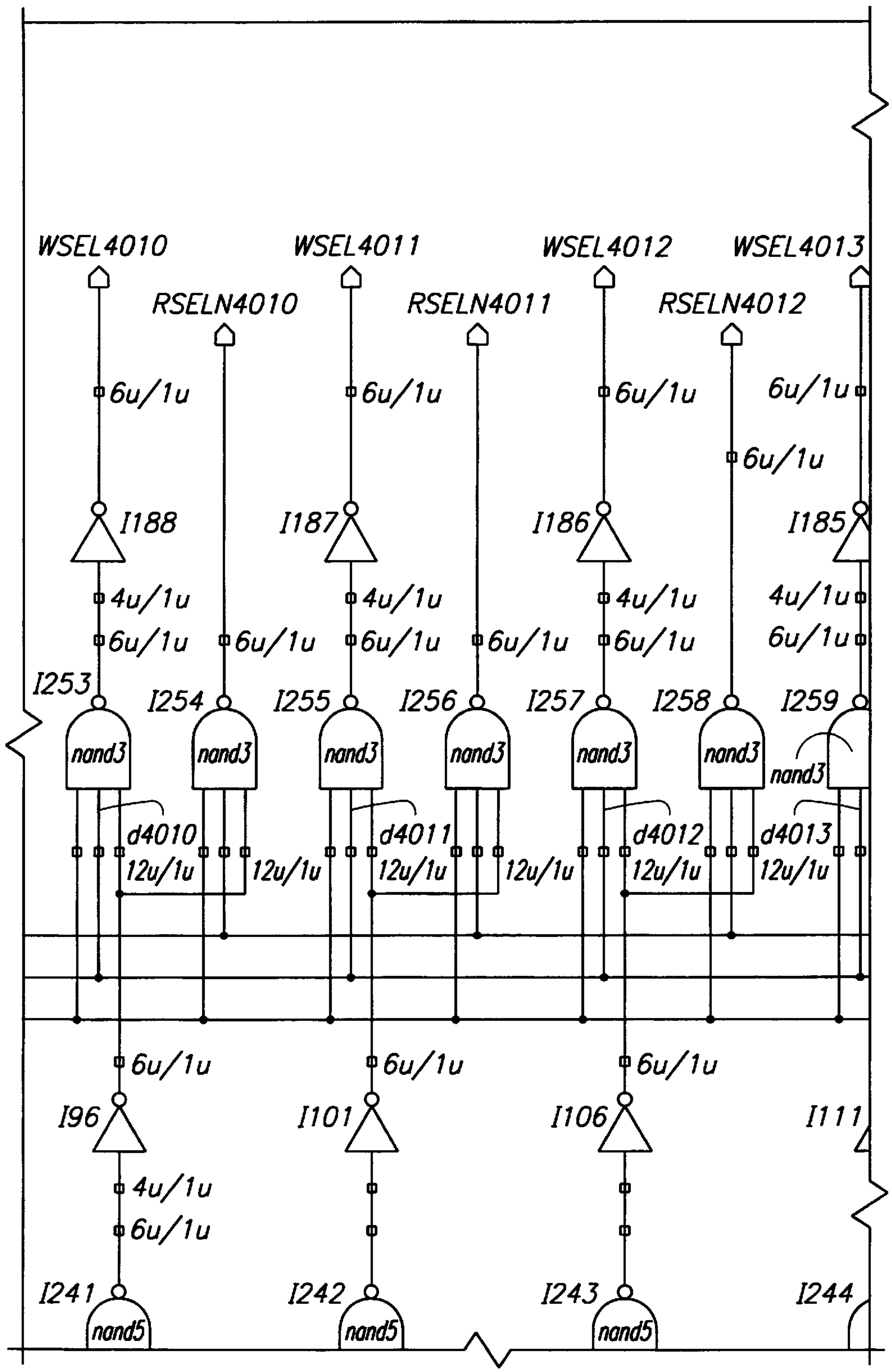
Fig 1.02AD

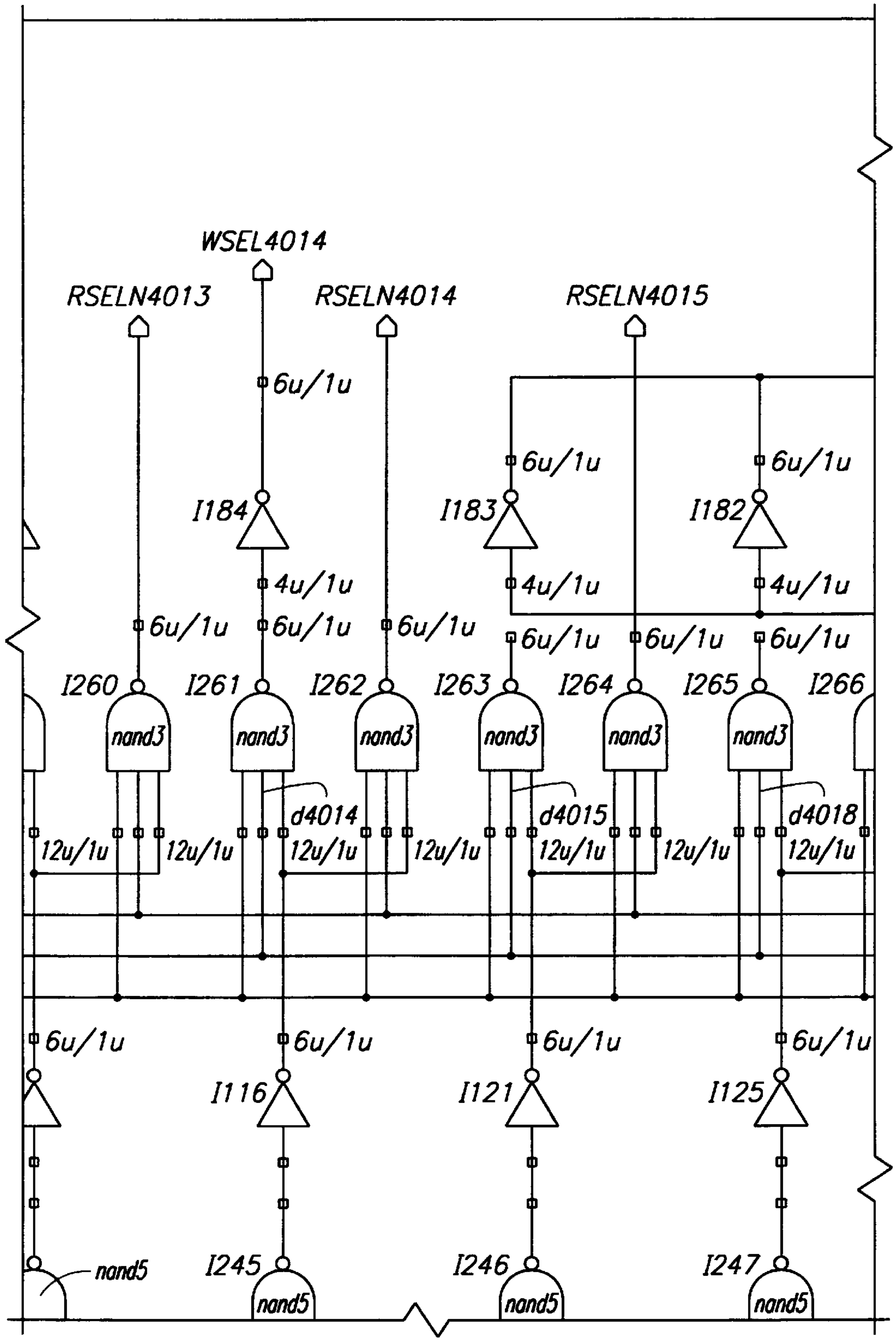
FIG. 1.02AE

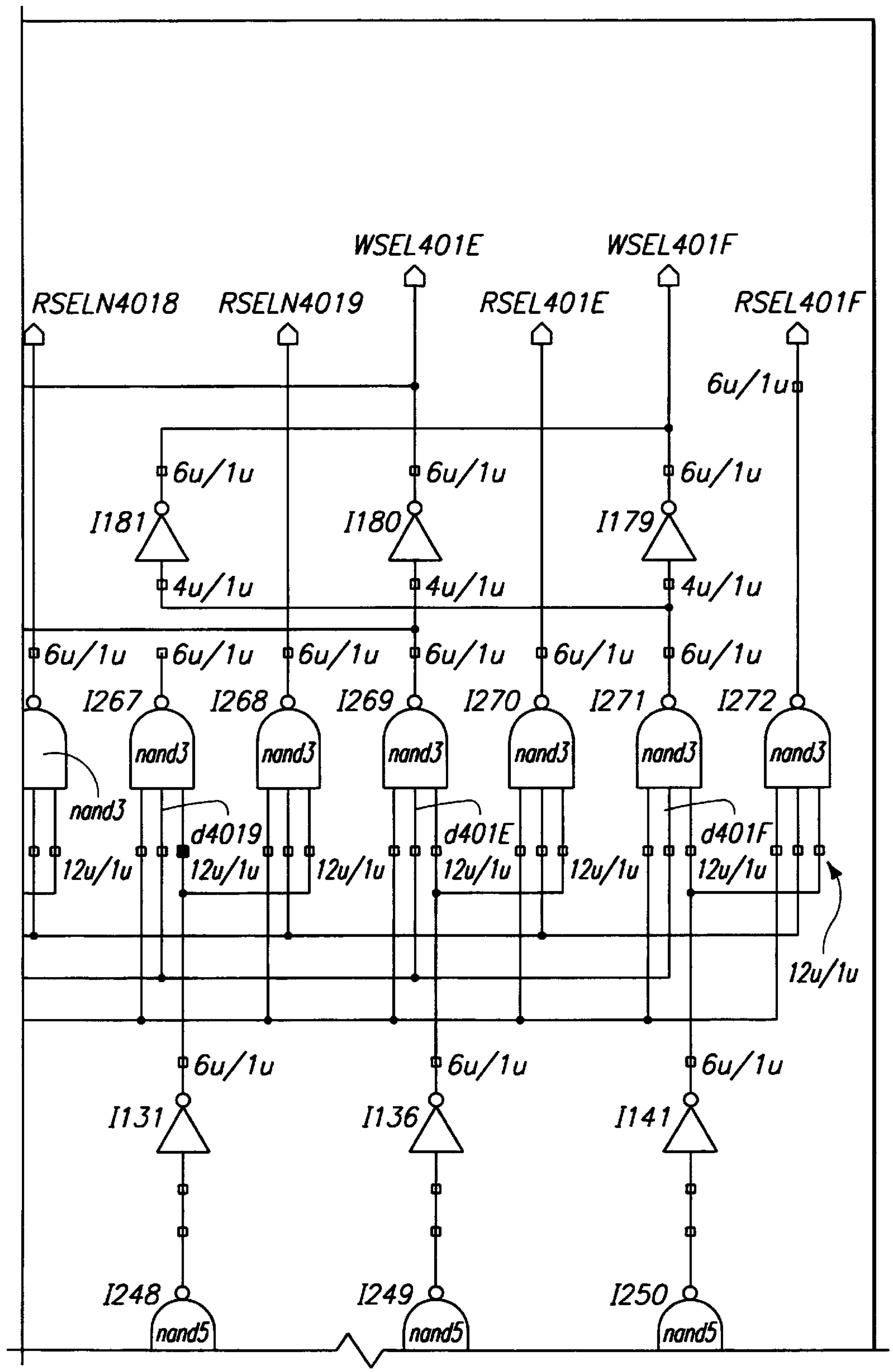
Fig 1 02AF

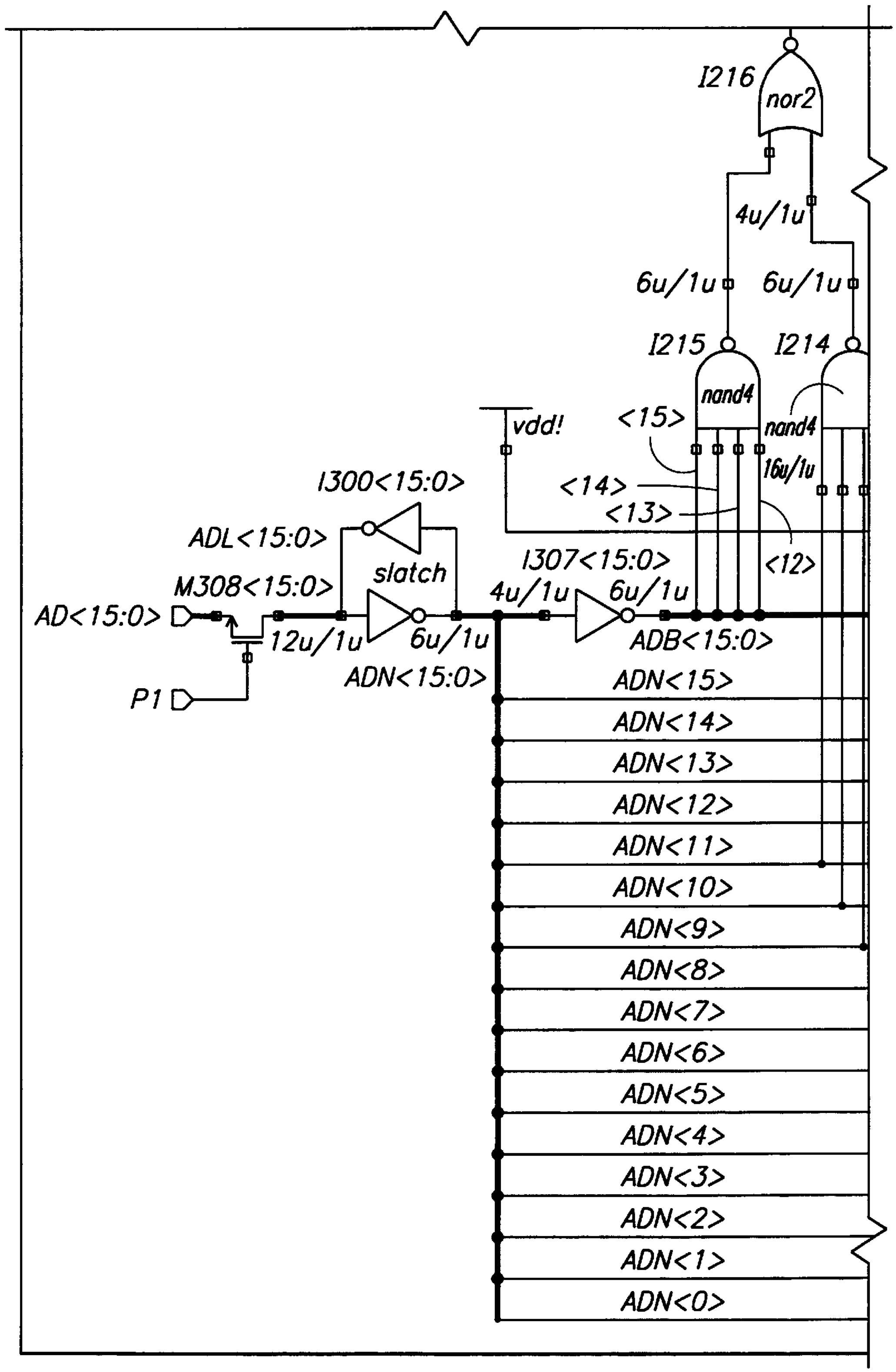
Fig 1.02BA

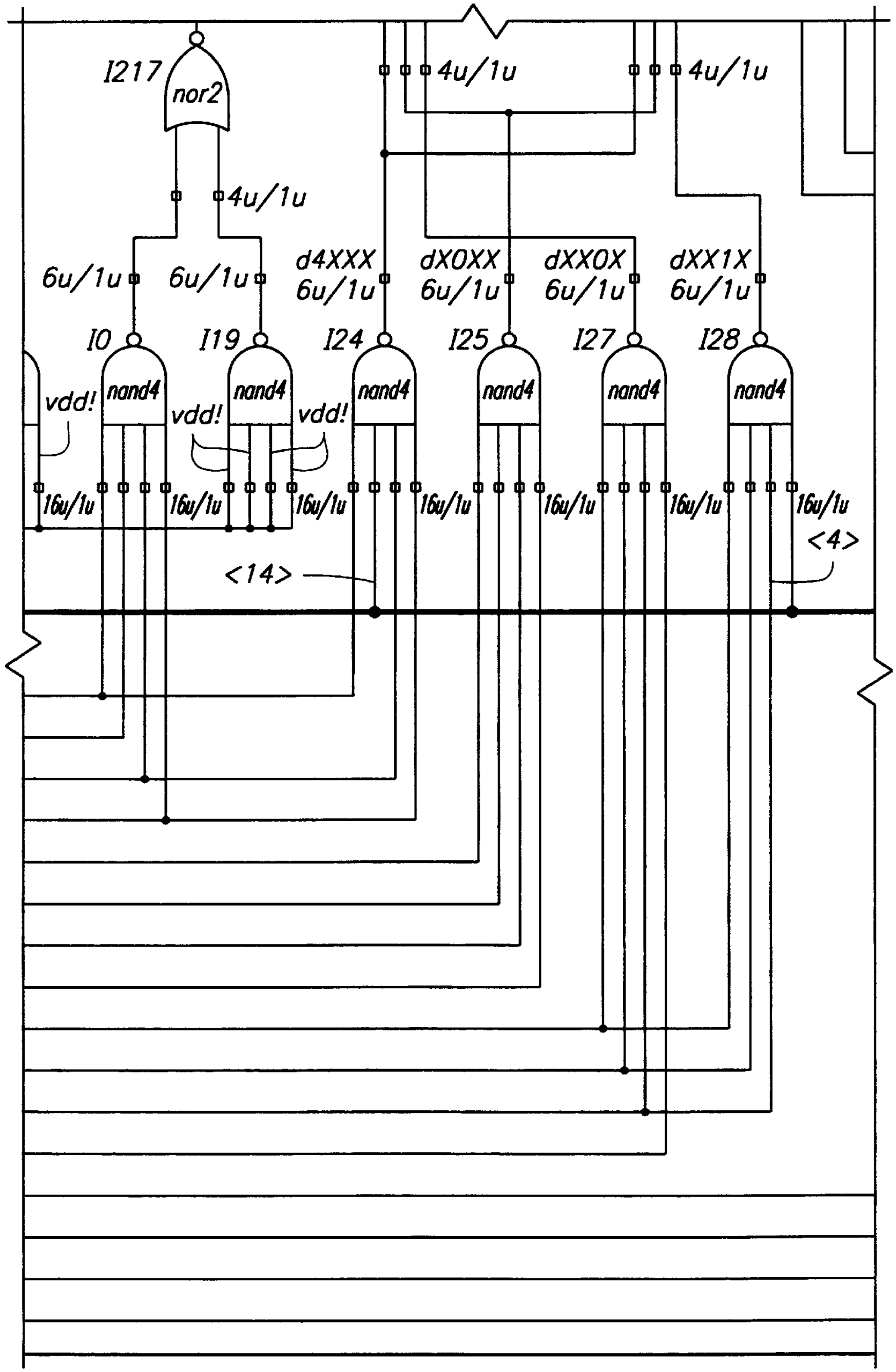
FIG 1.02BB

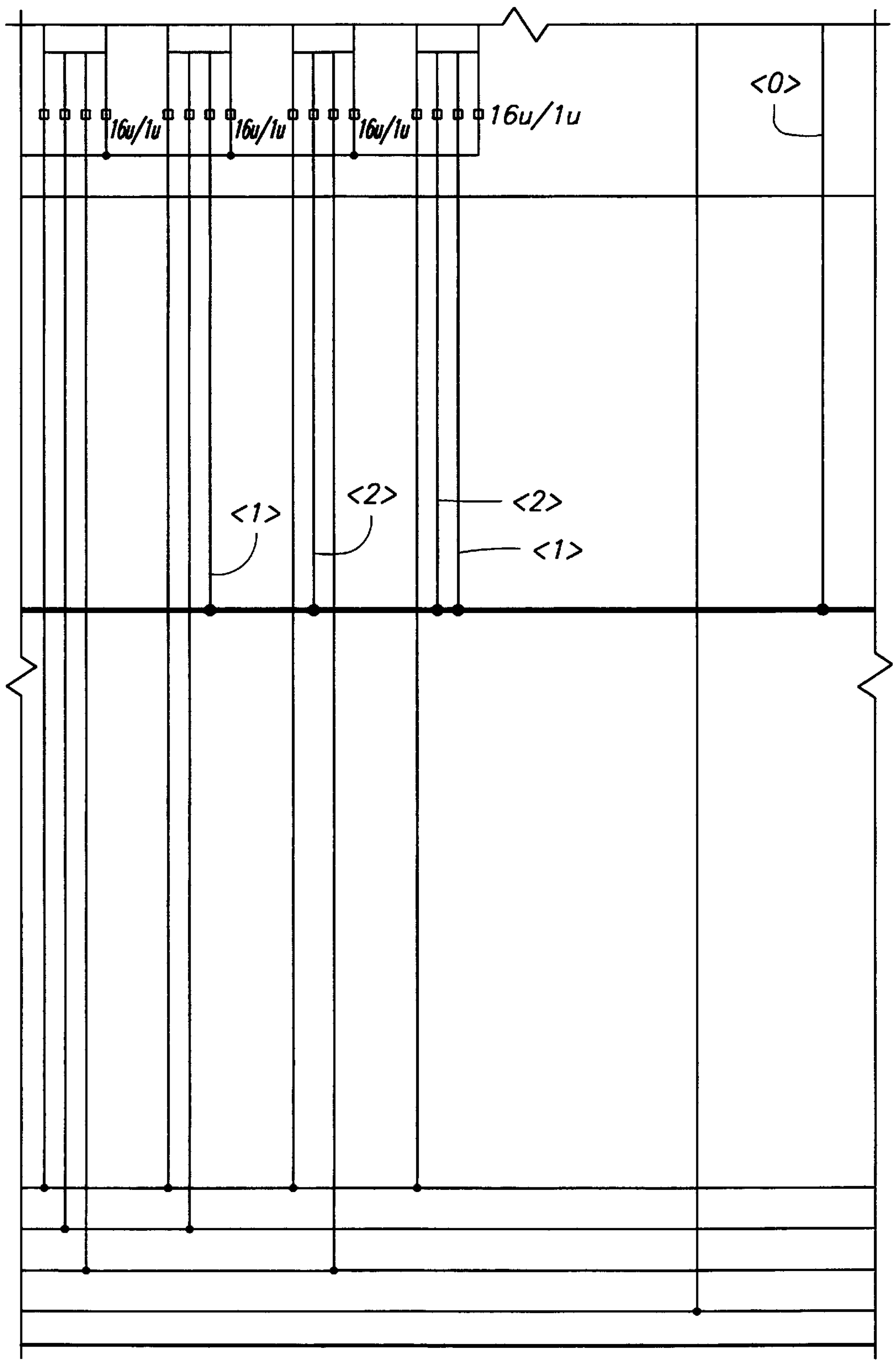
Fig 1.02BC

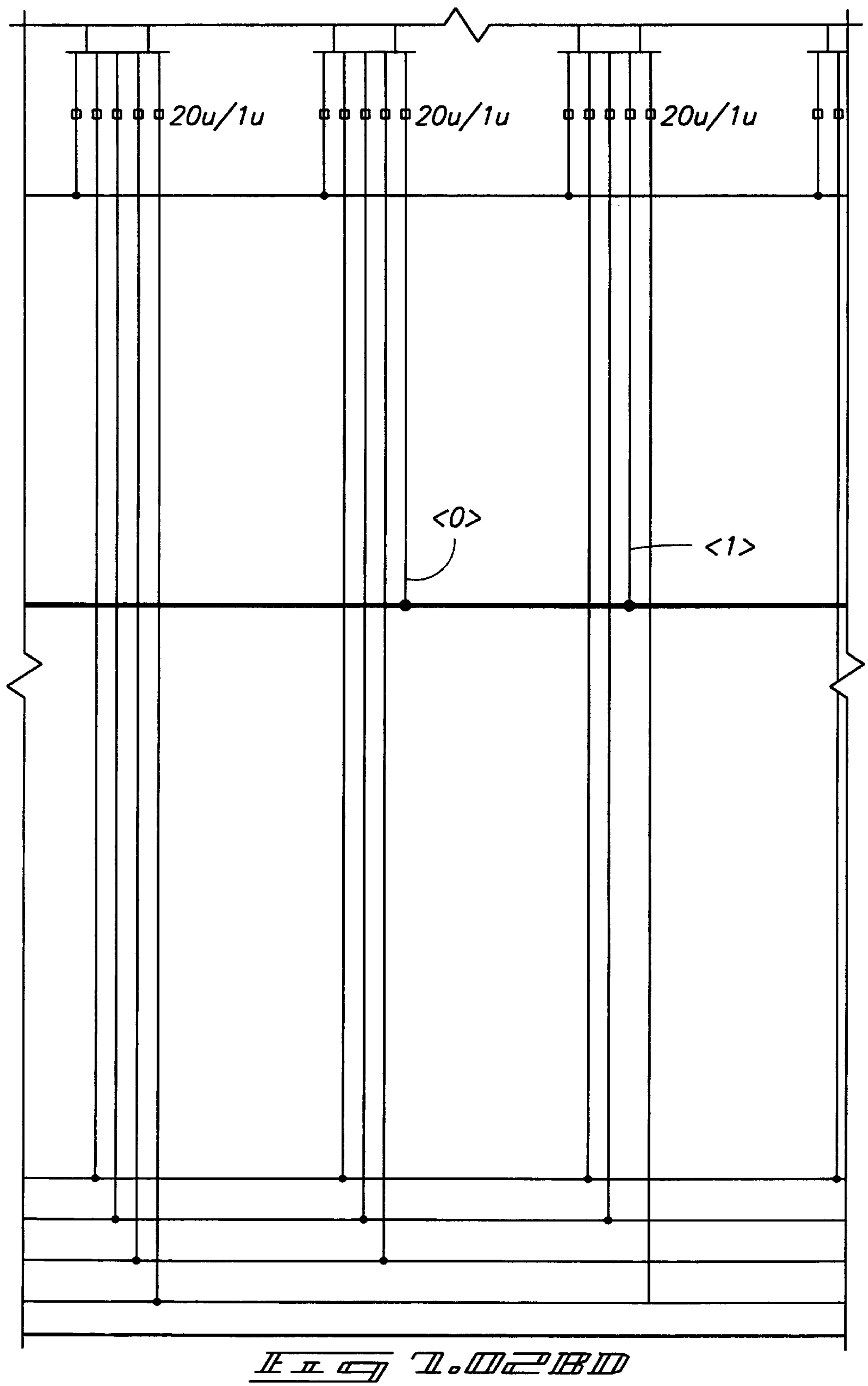
Fig. 7.028D

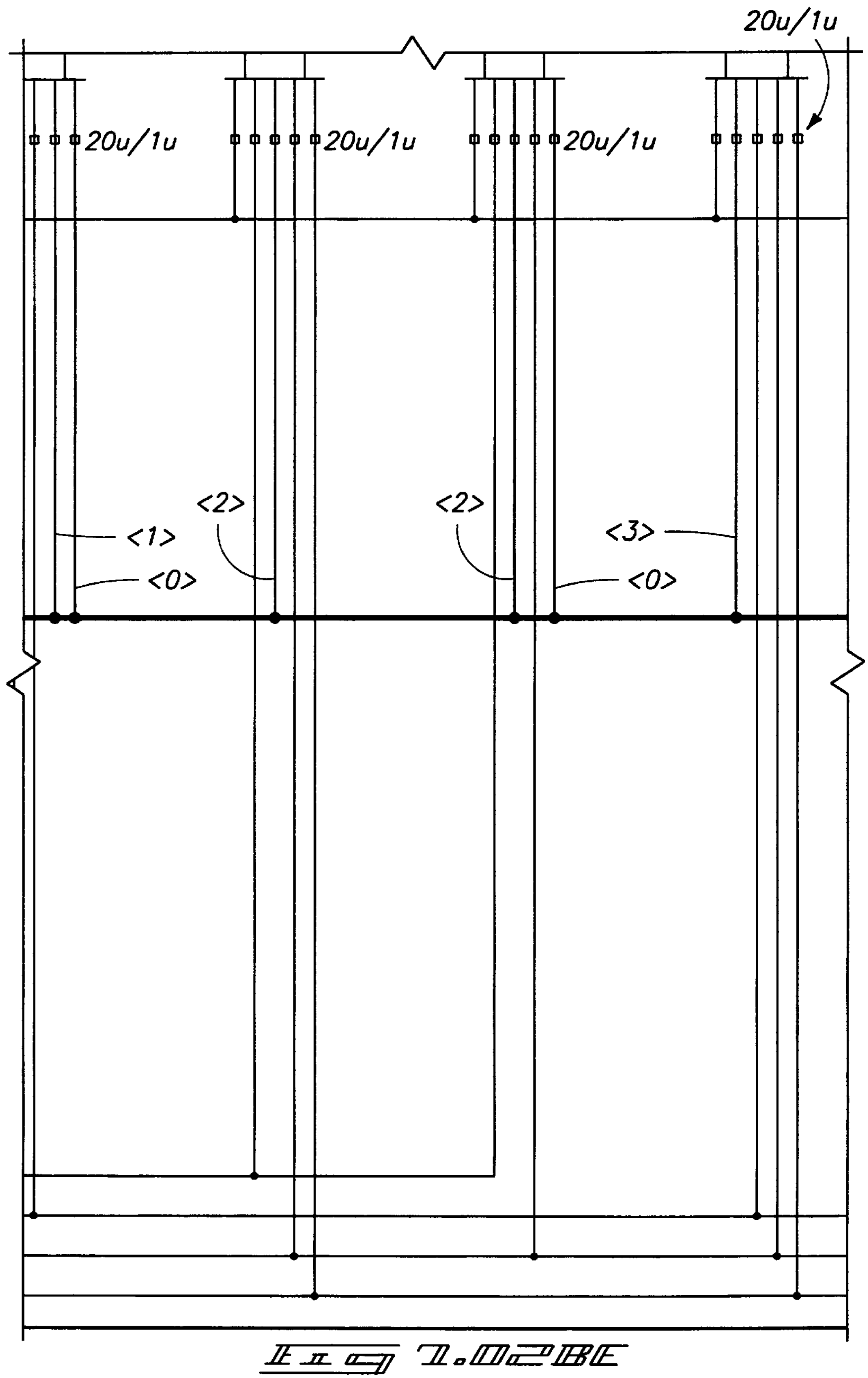
Fig 1.02BE

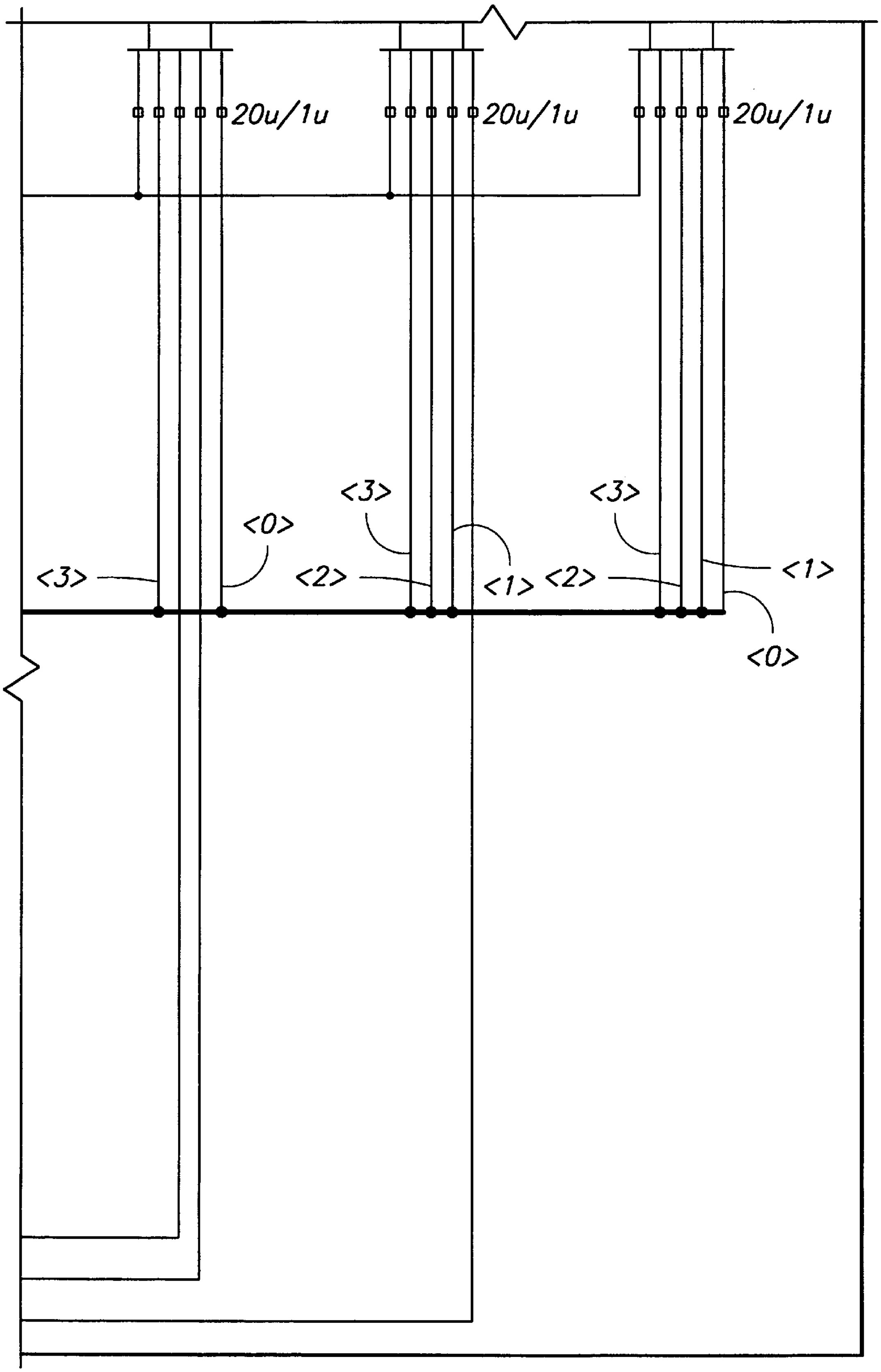
Fig 1.02BF

| | | | | | | | |
|---|---|---|---|---|---|---|---|
| 7.03AA | 7.03AB | 7.03AC | 7.03AD | 7.03AE | 7.03AF | 7.03AG | 7.03AH |
| 7.03BA | 7.03BB | 7.03BC | 7.03BD | 7.03BE | 7.03BF | 7.03BG | 7.03BH |
| 7.03CA | 7.03CB | 7.03CC | 7.03CD | 7.03CE | 7.03CF | 7.03CG | 7.03CH |
| 7.03DA | 7.03DB | 7.03DC | 7.03DD | 7.03DE | 7.03DF | 7.03DG | 7.03DH |
| 7.03EA | 7.03EB | 7.03EC | 7.03ED | 7.03EE | 7.03EF | 7.03EG | 7.03EH |

Fig. 7.03

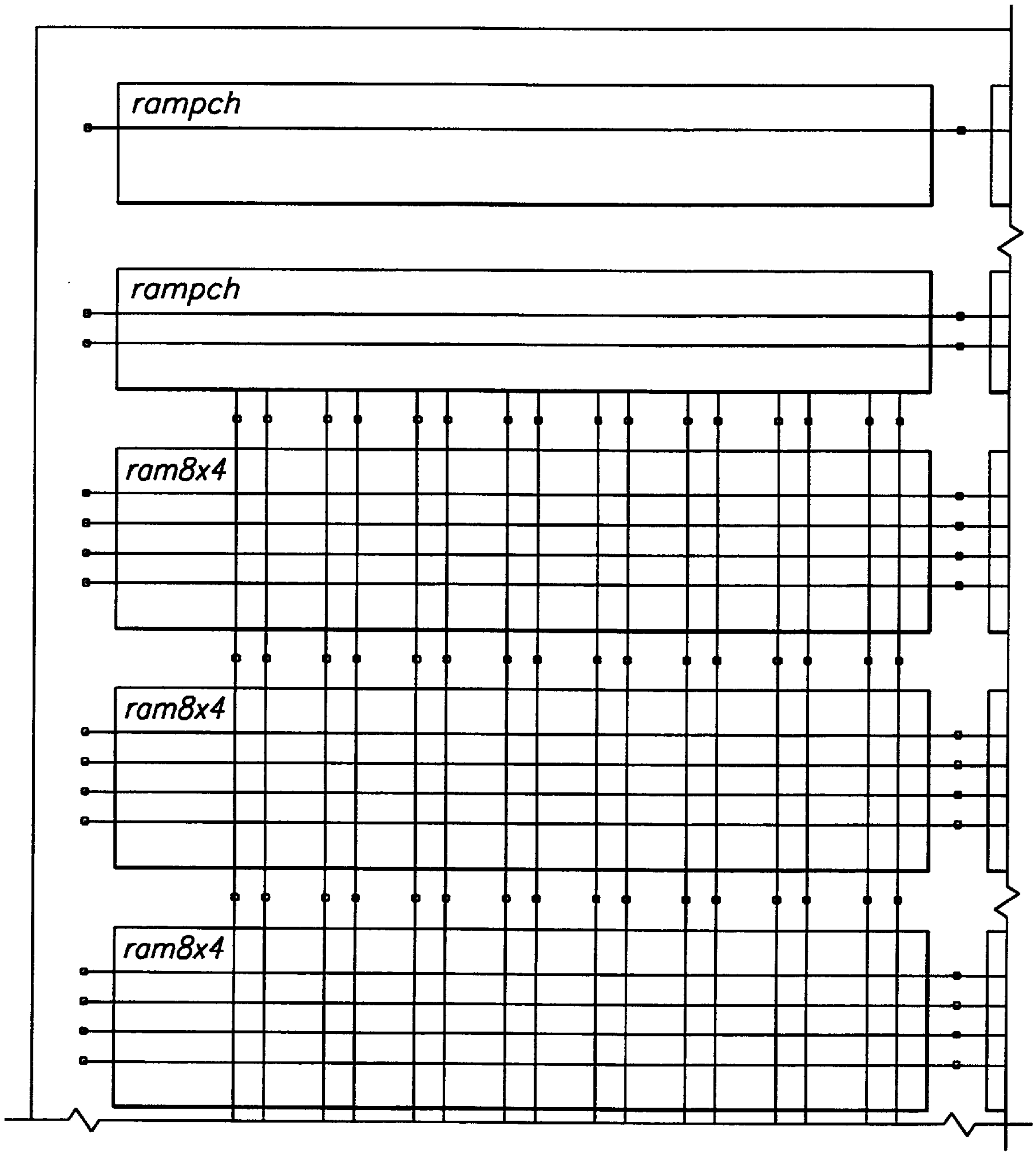
Fig 1.03AA

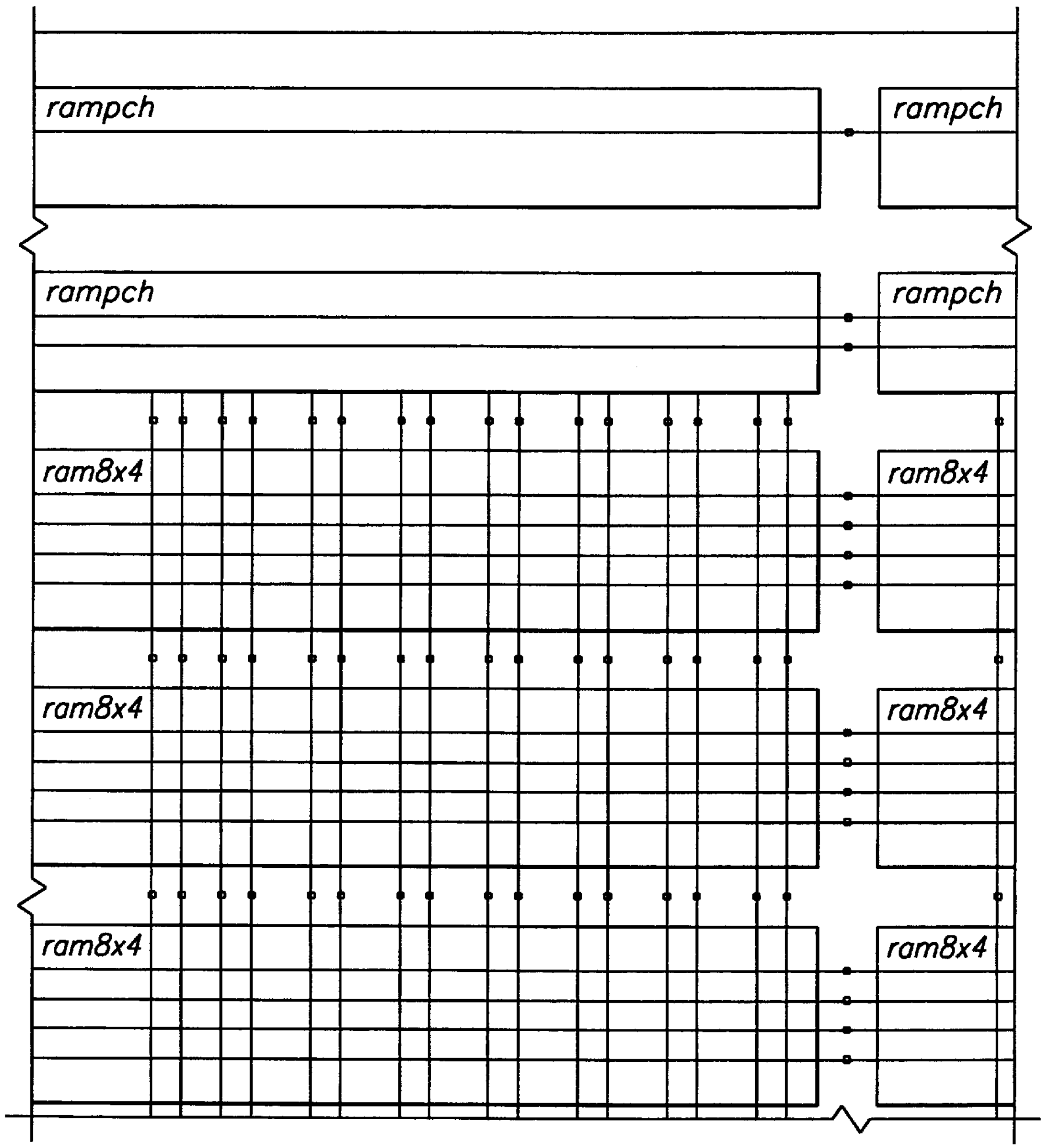
Fig 1.03AB

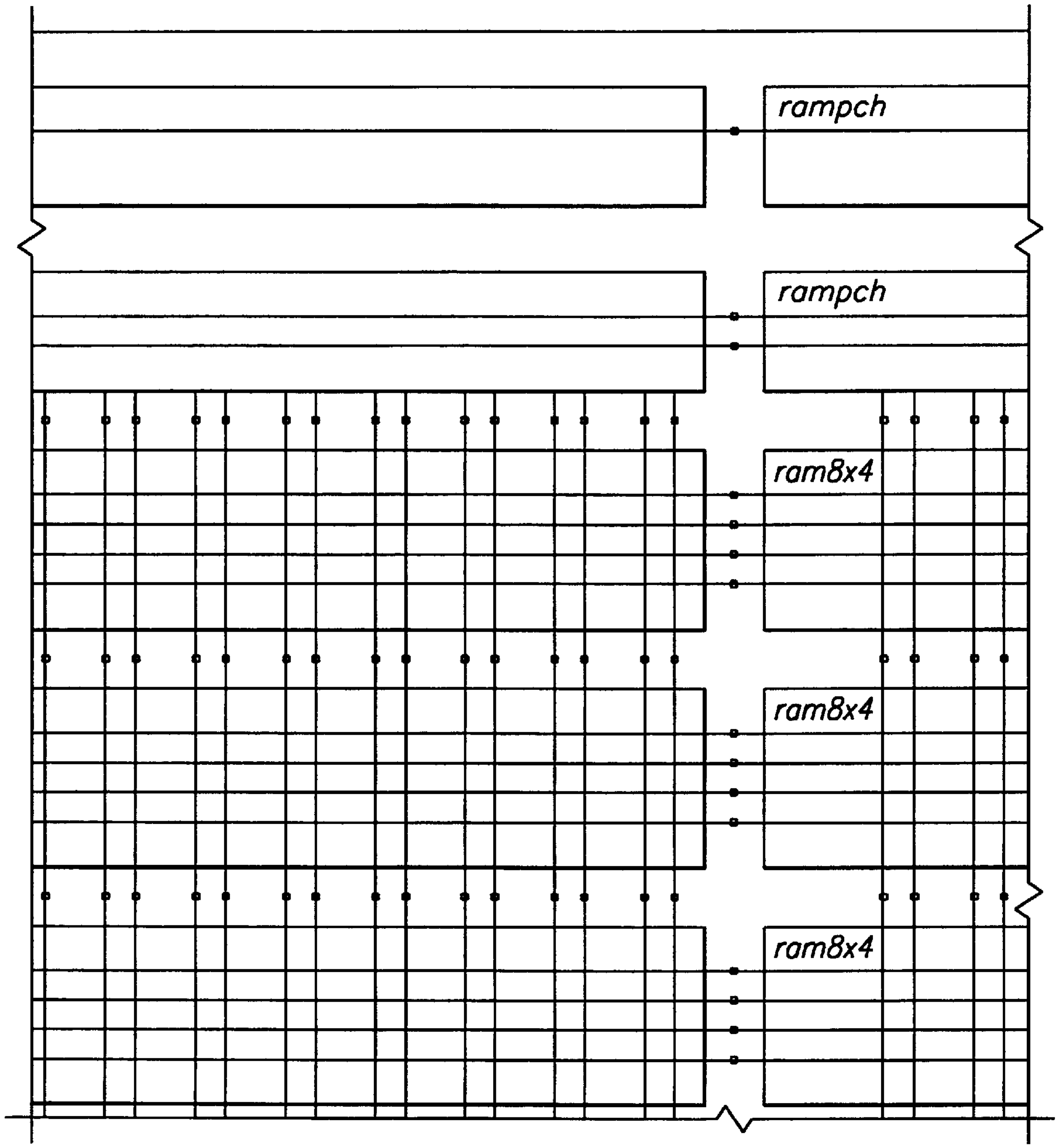
Fig 7.03AC

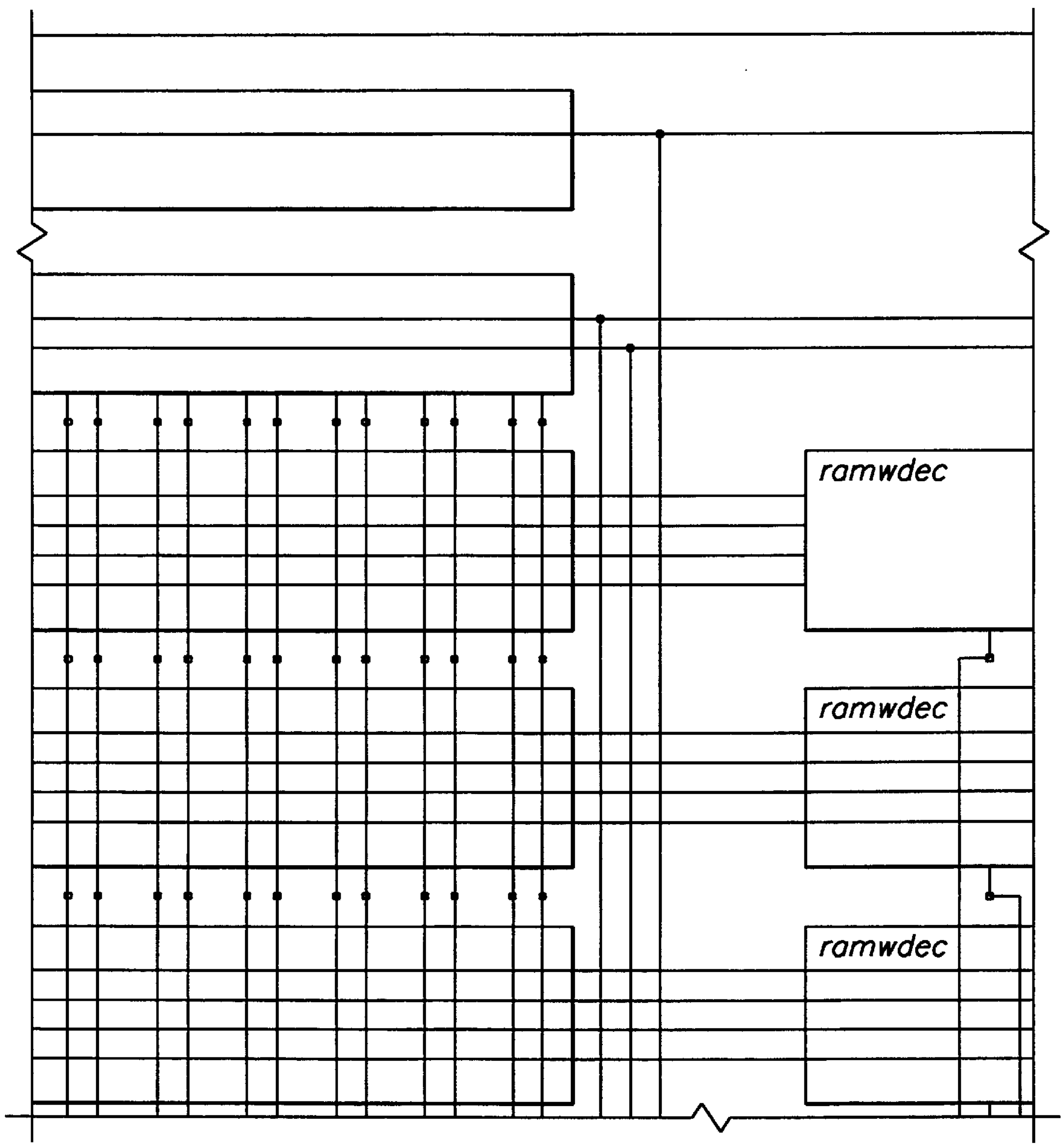
FIG. 7.03AD

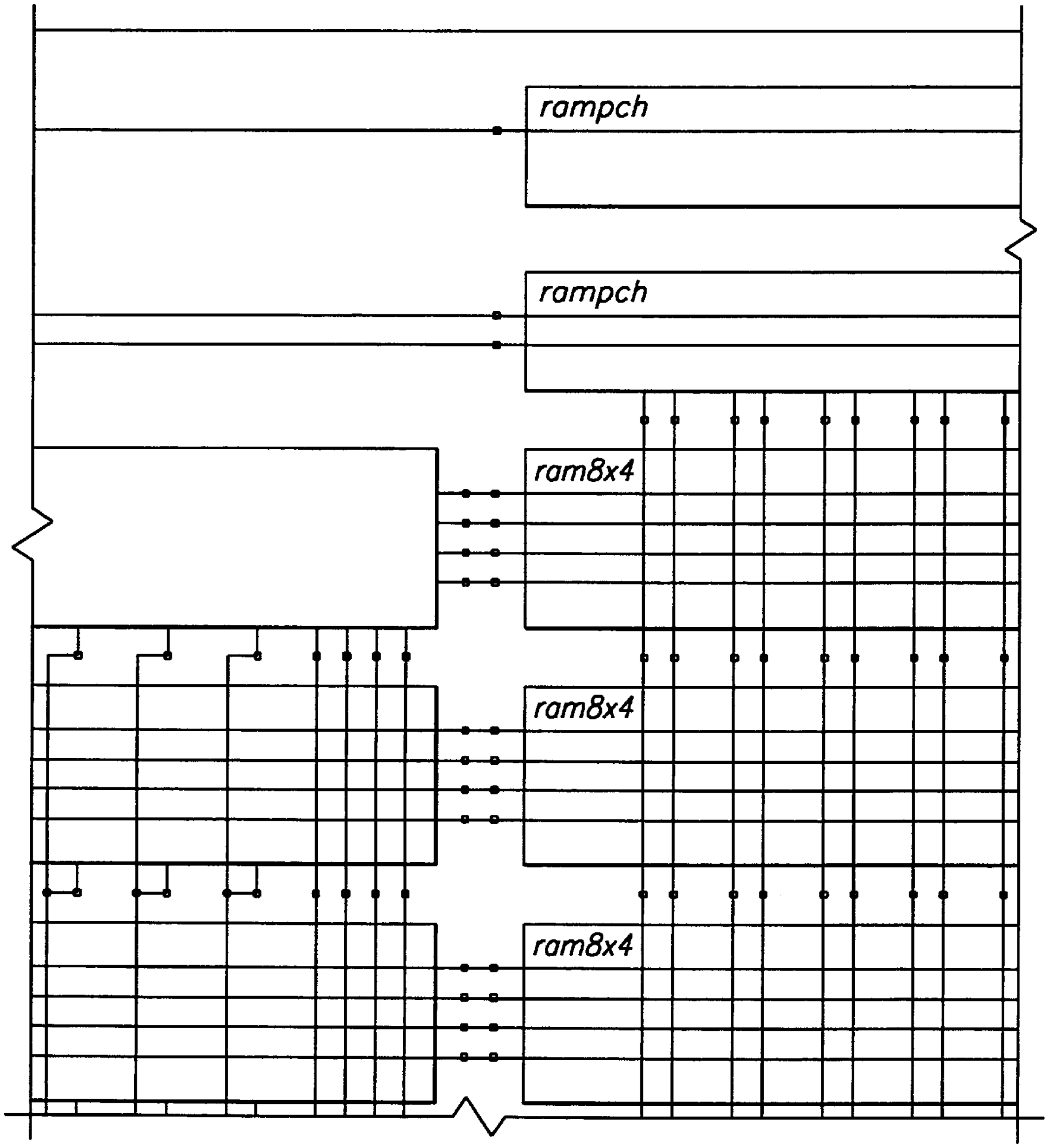
Fig 7.03AE

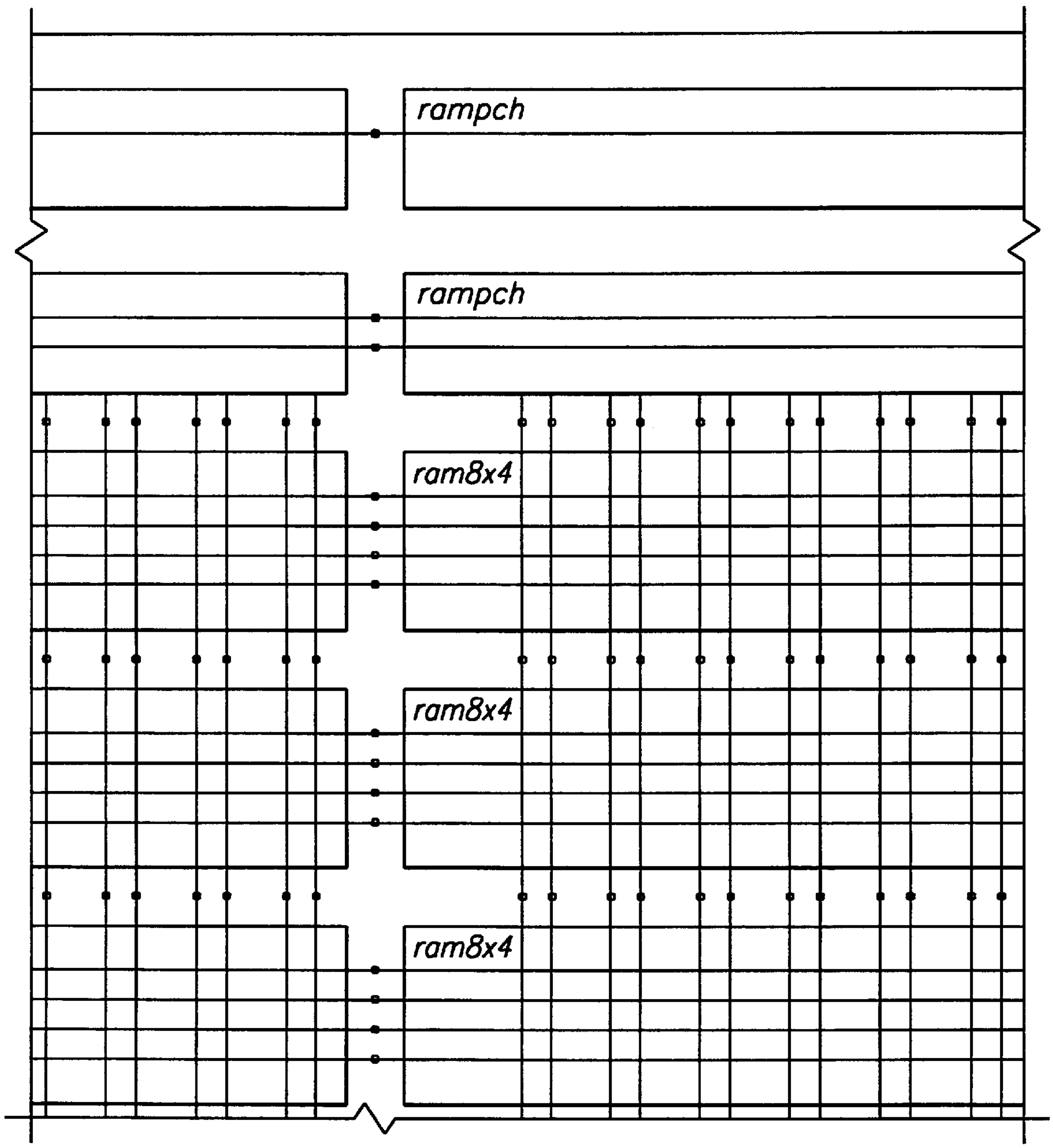
Fig 7.03AF

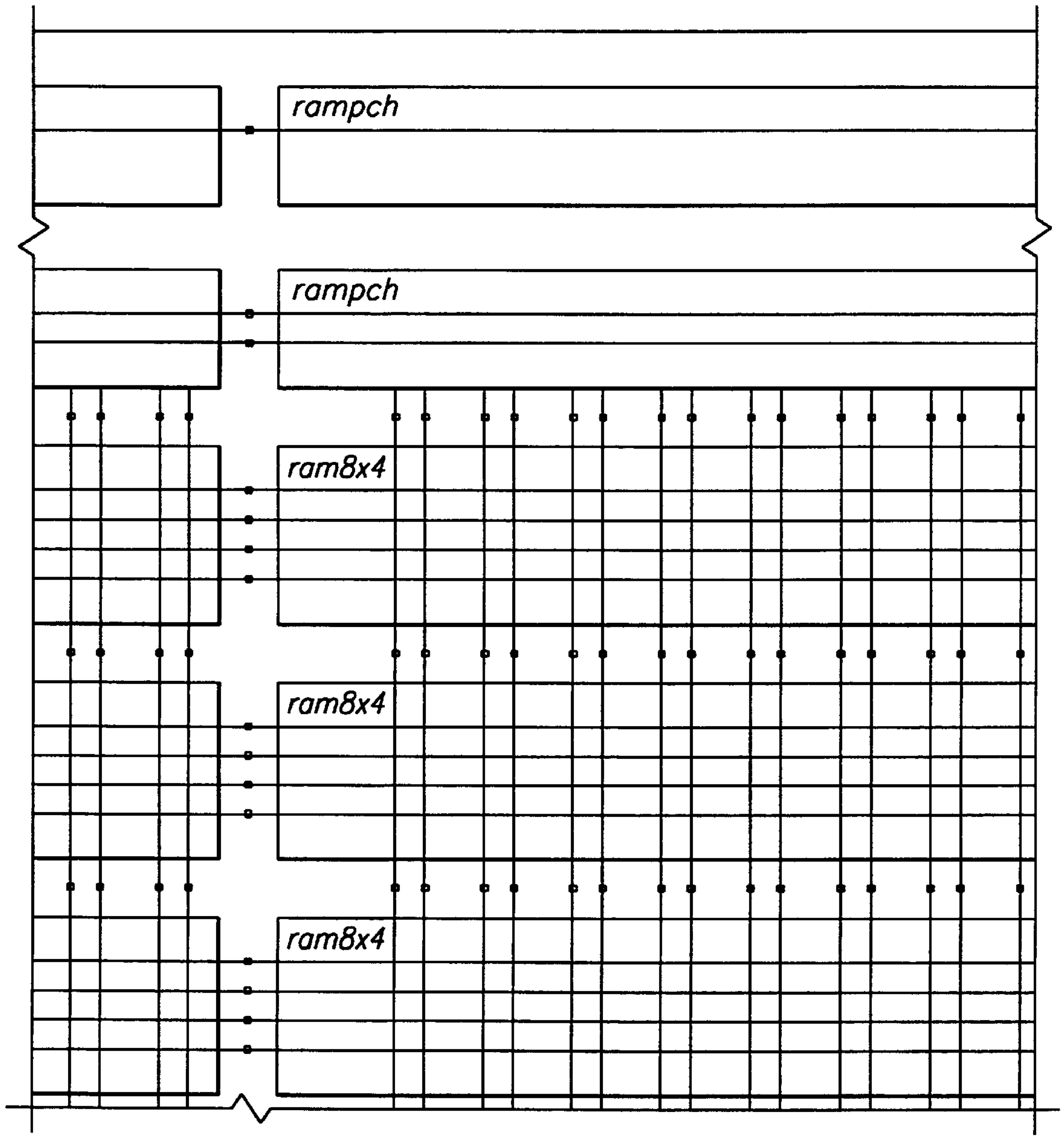
Fig 1.03AG

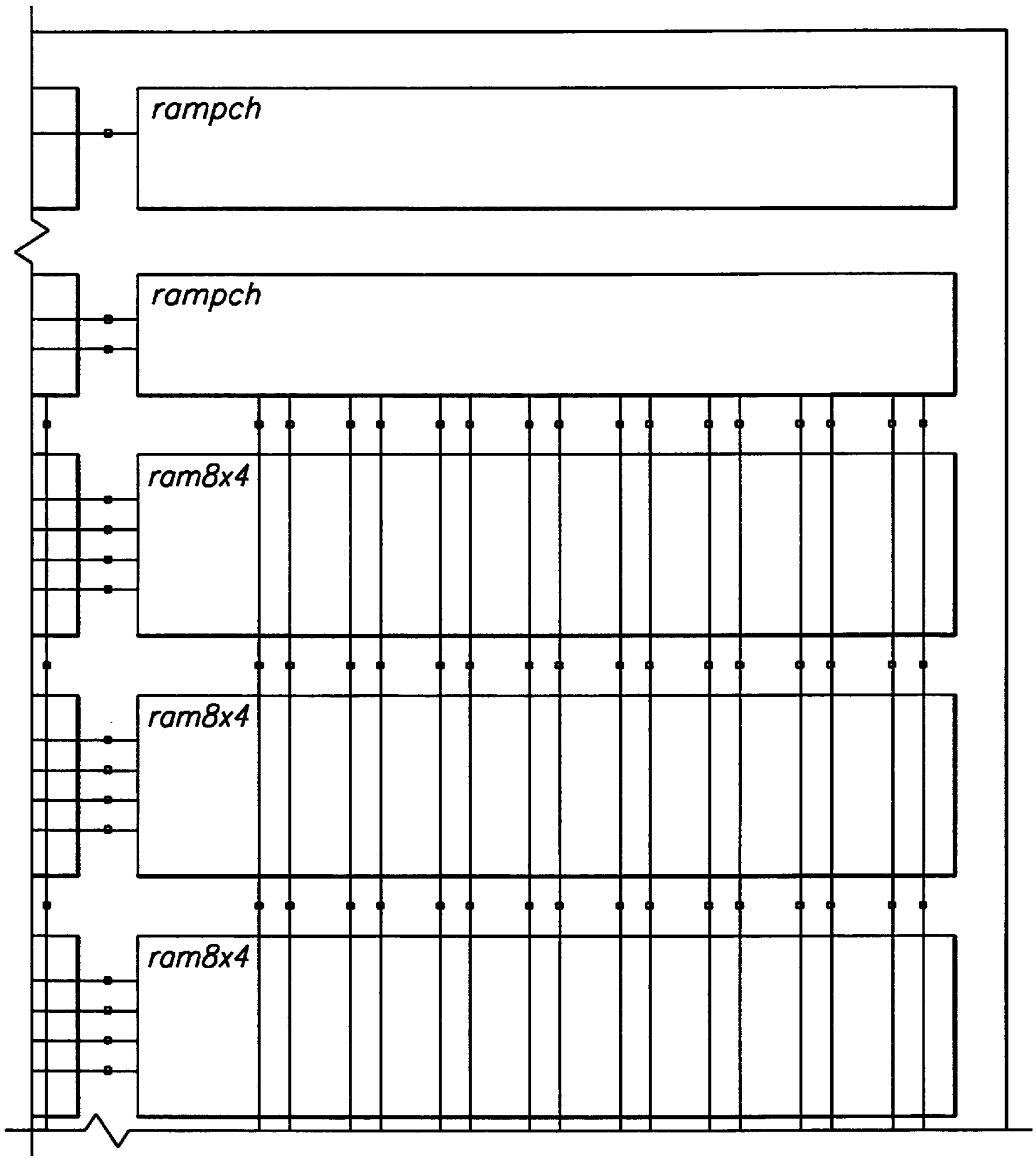
FIG. 7.03AH

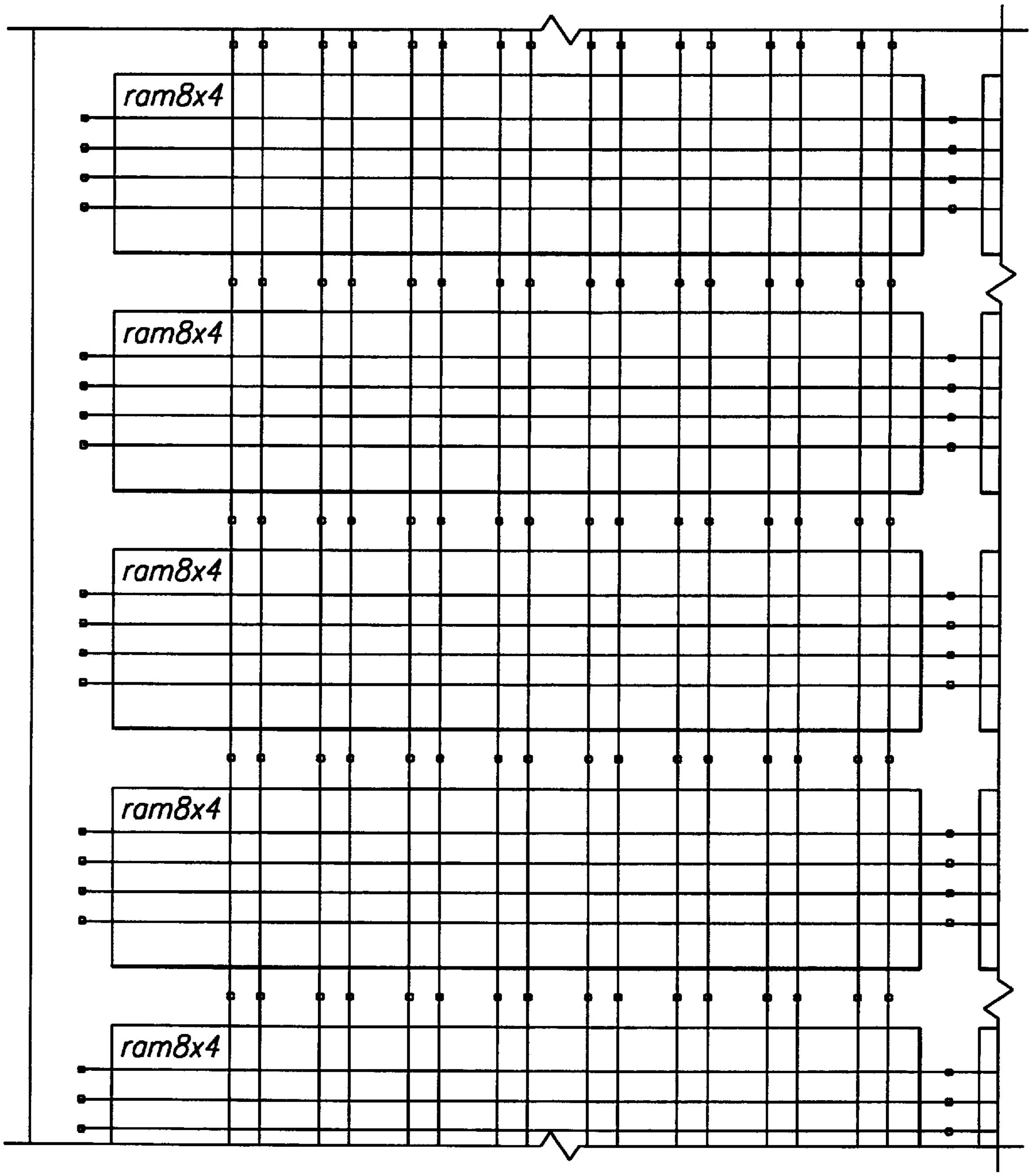
Fig 7.03BA

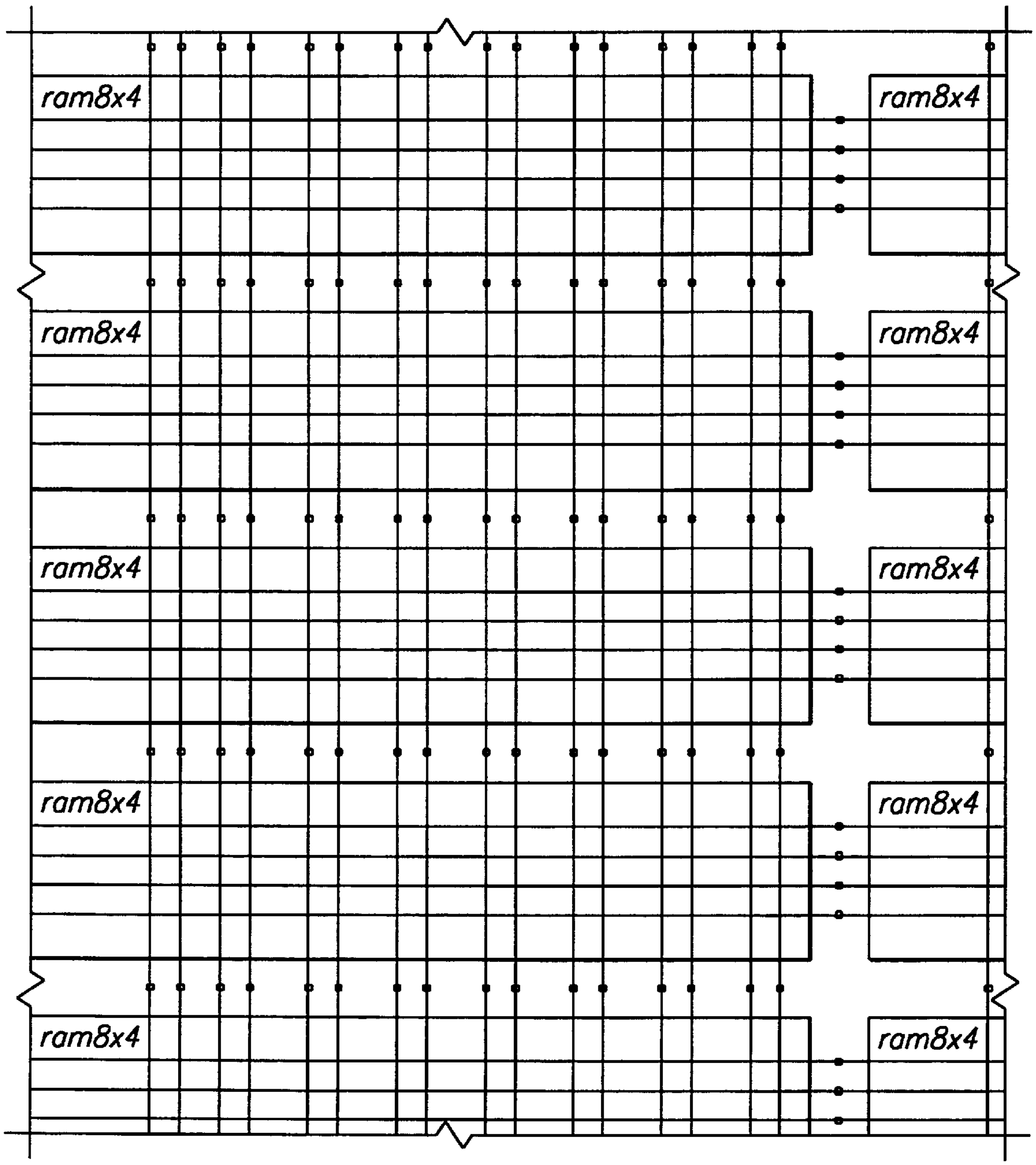
Fig. 7.03BB

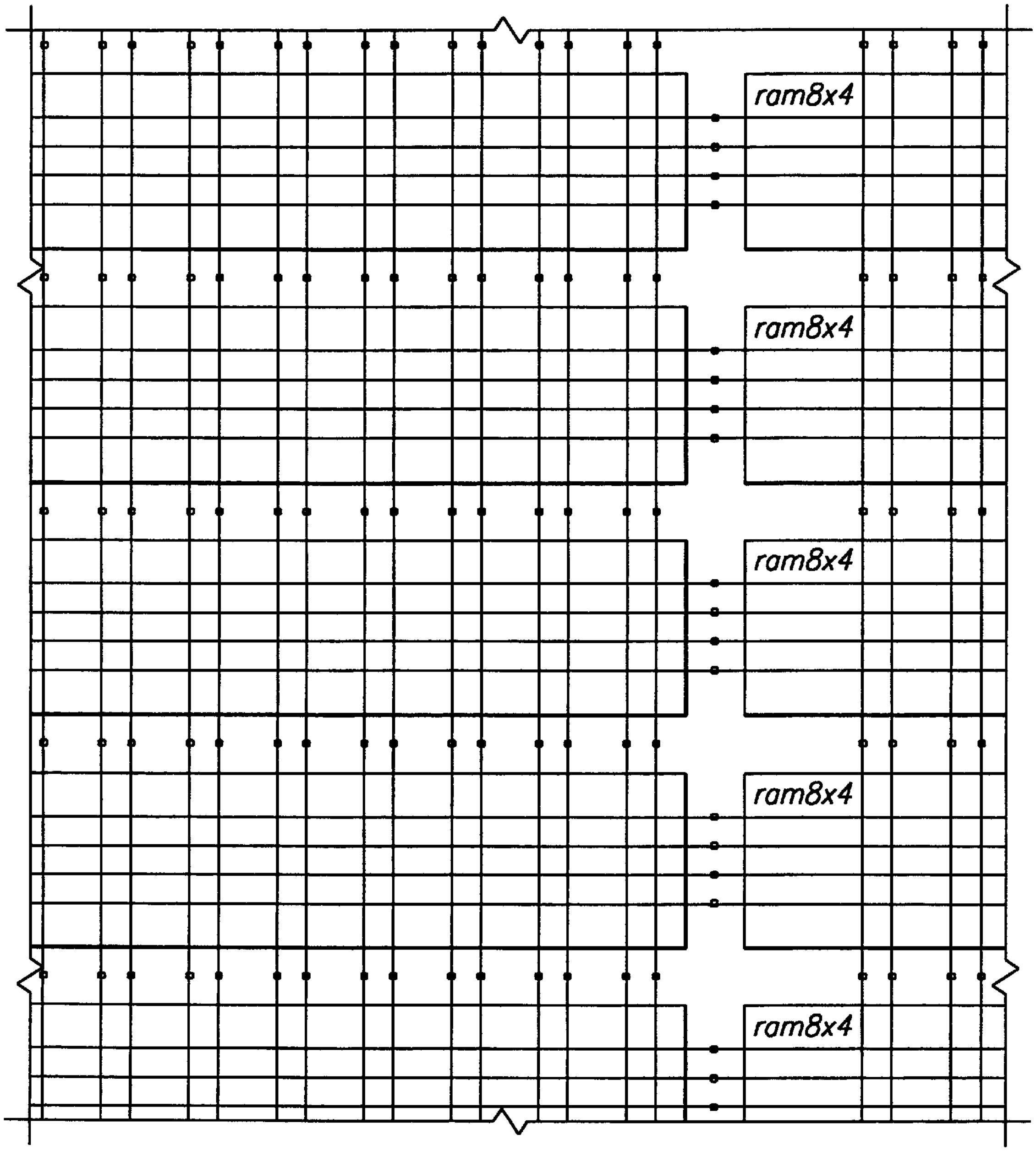
Fig. 7.03BC

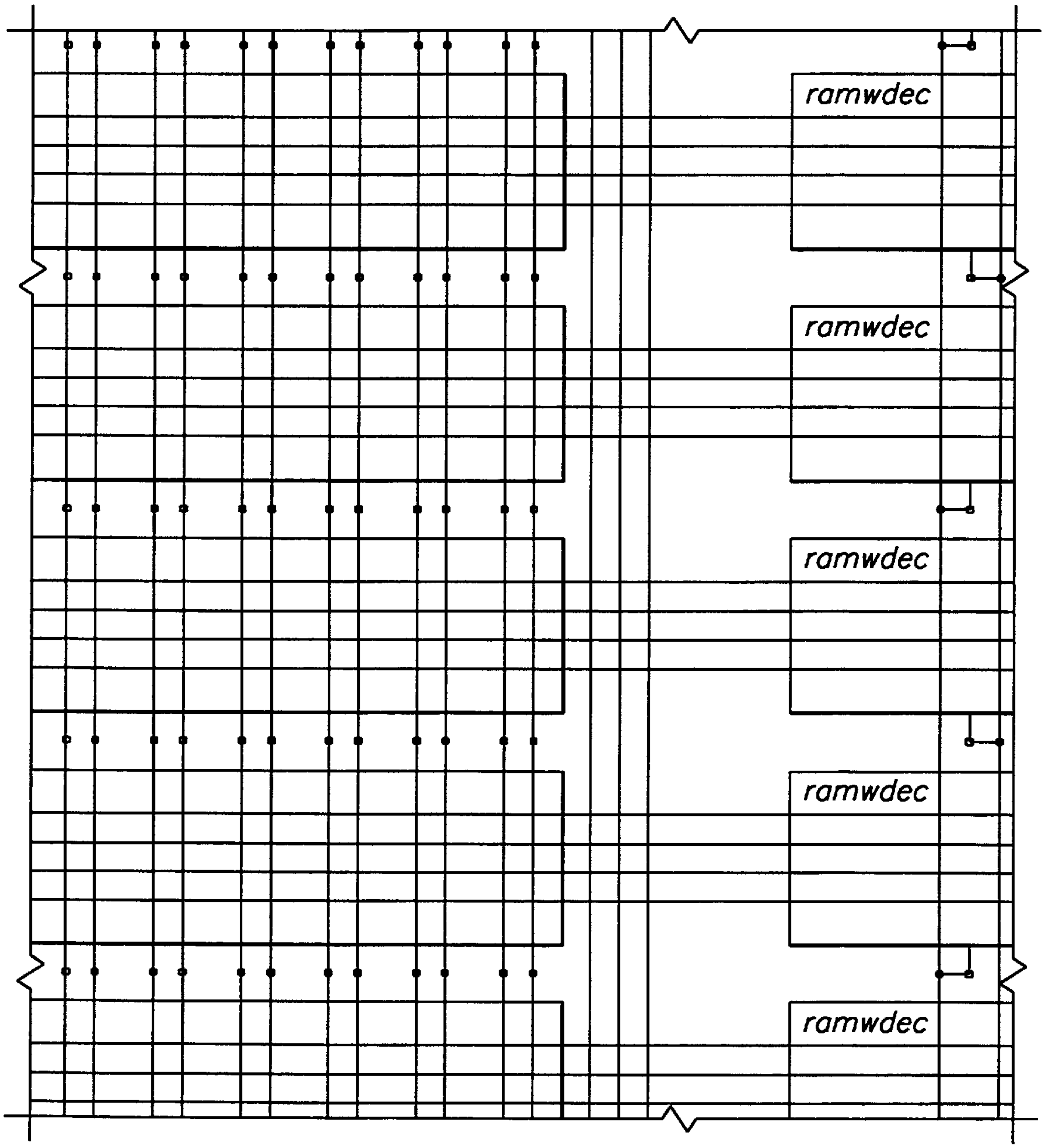
Fig 7.03BD

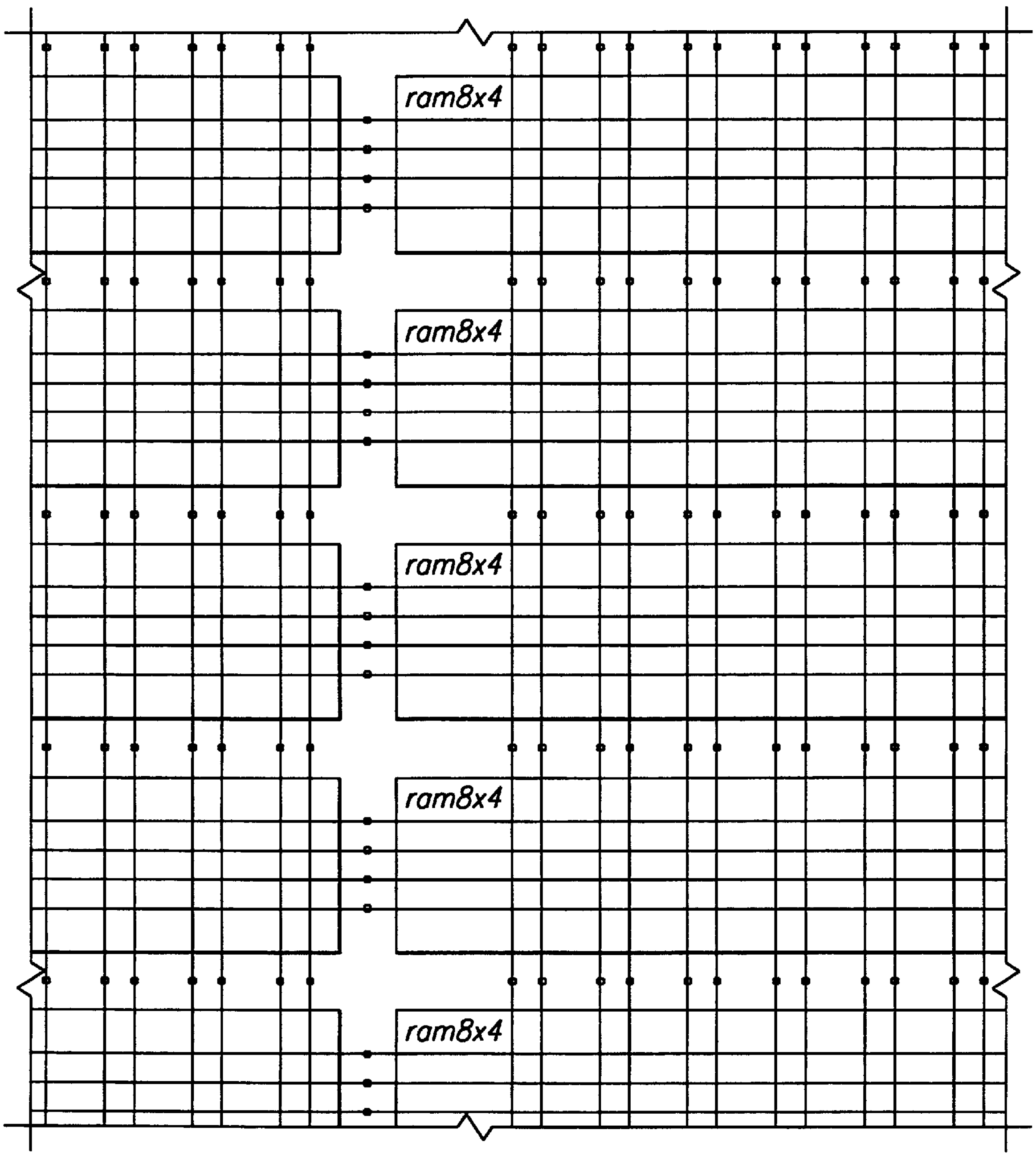
Fig 7.03BE

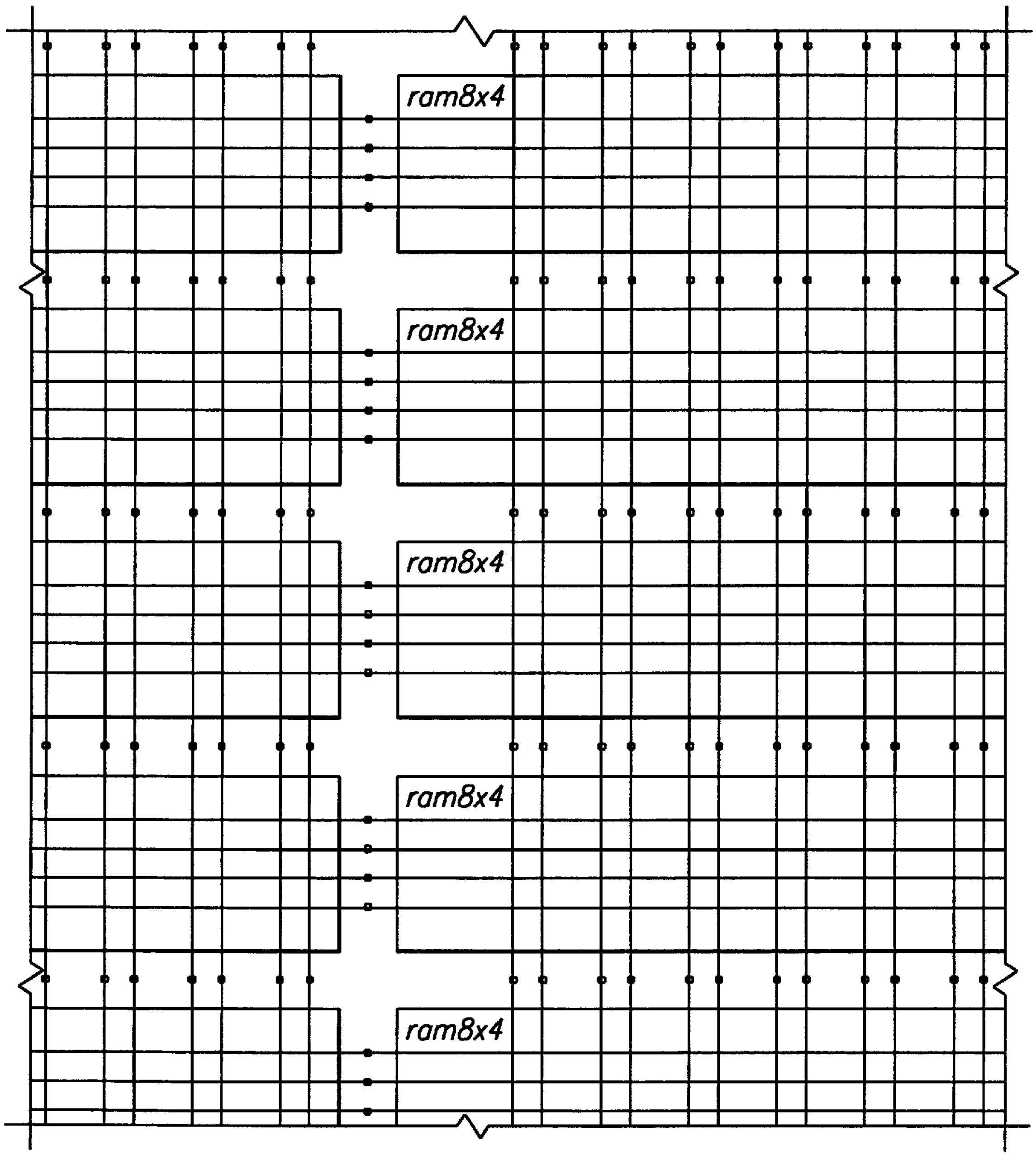
Fig 1.03BF

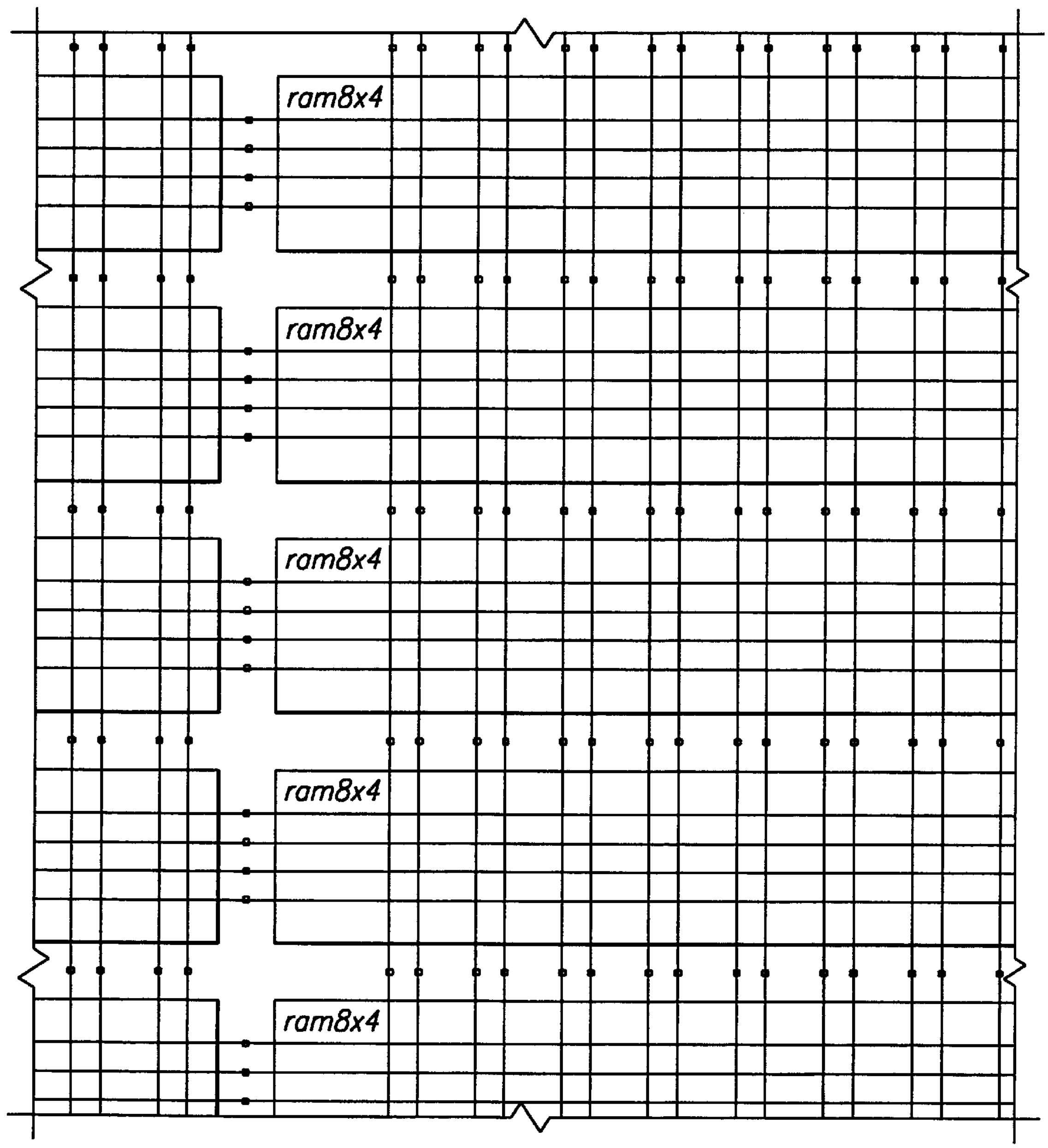
Fig. 2.03BG

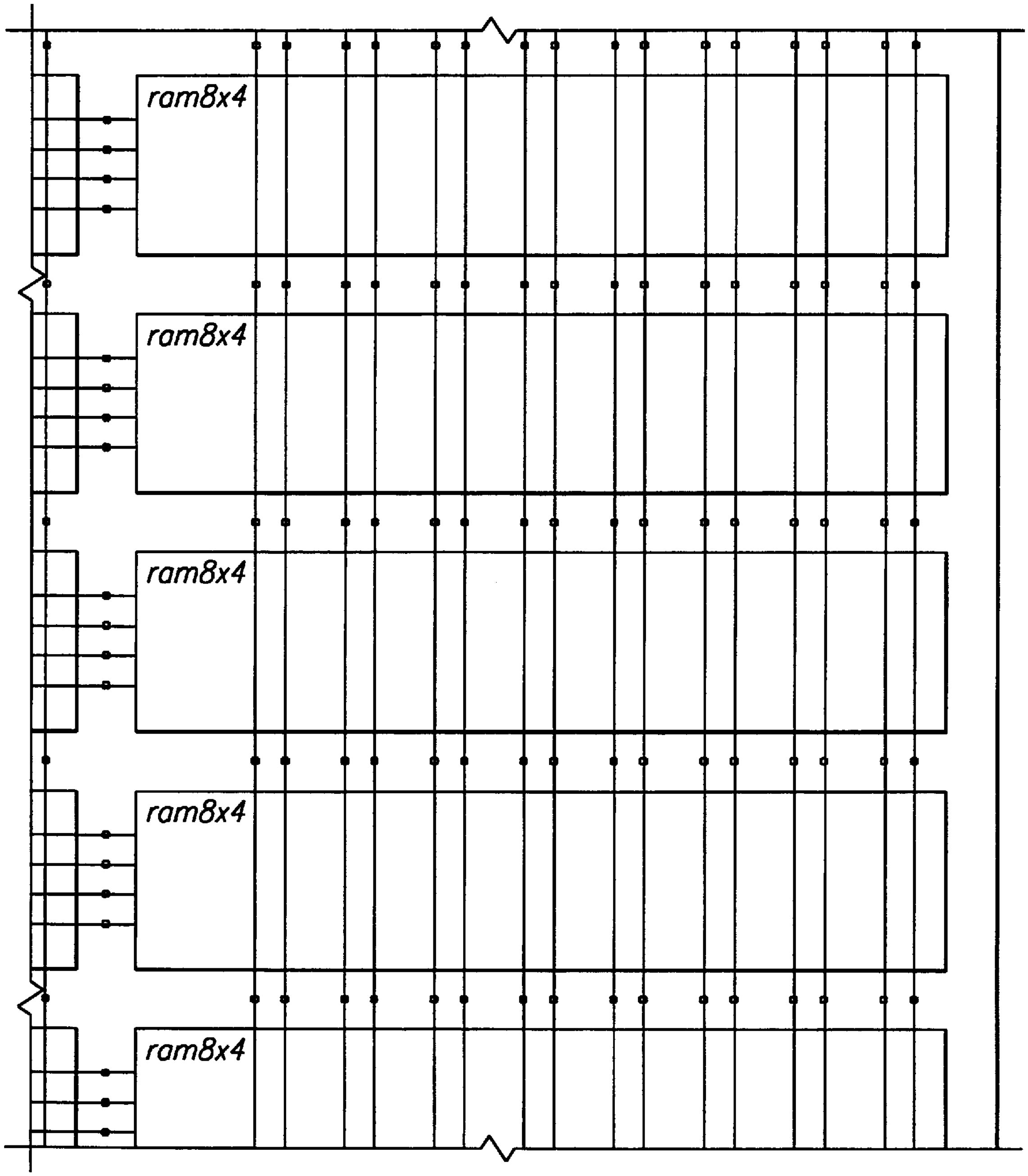
Fig. 7.03BH

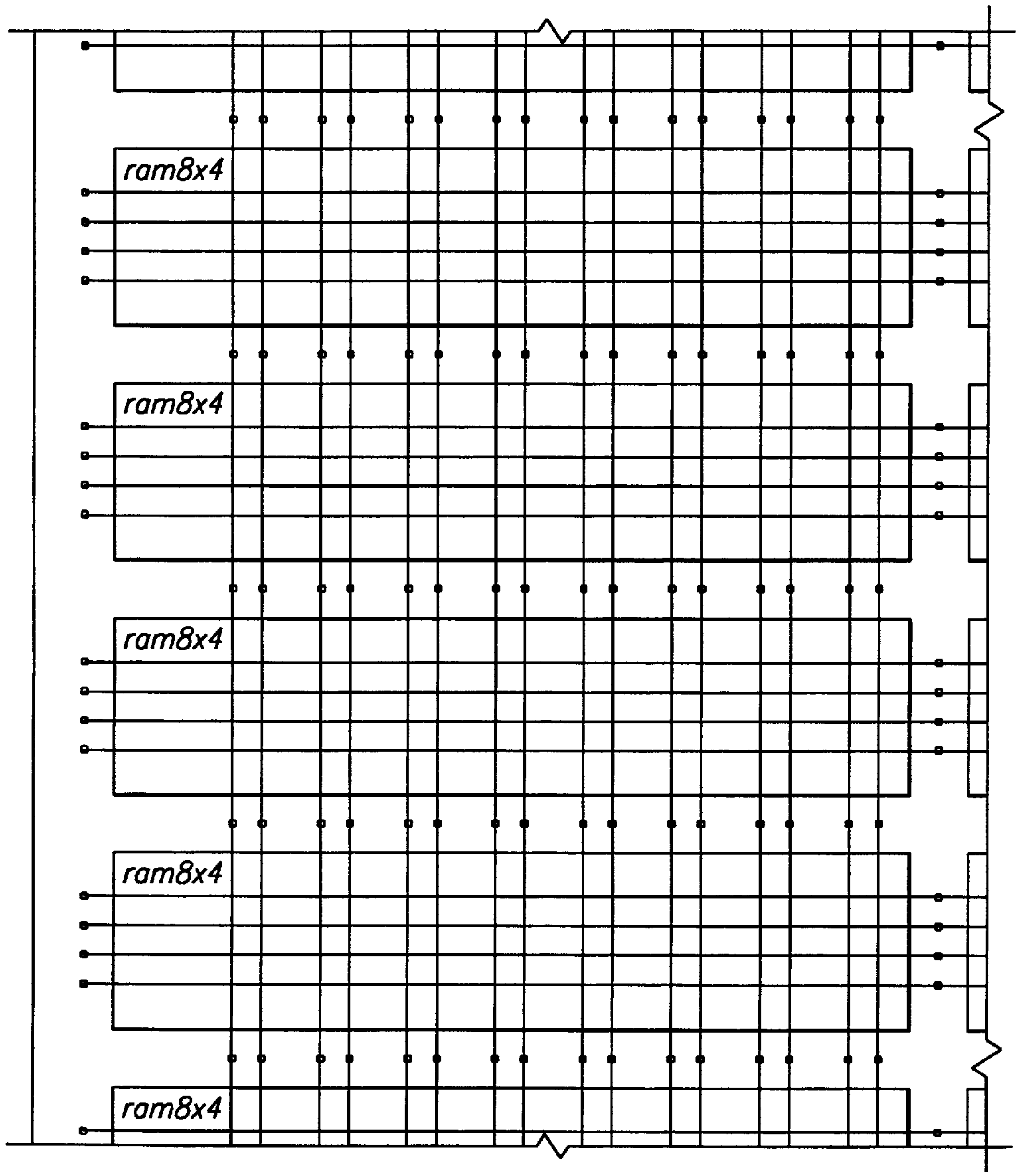
Fig. 1.03CA

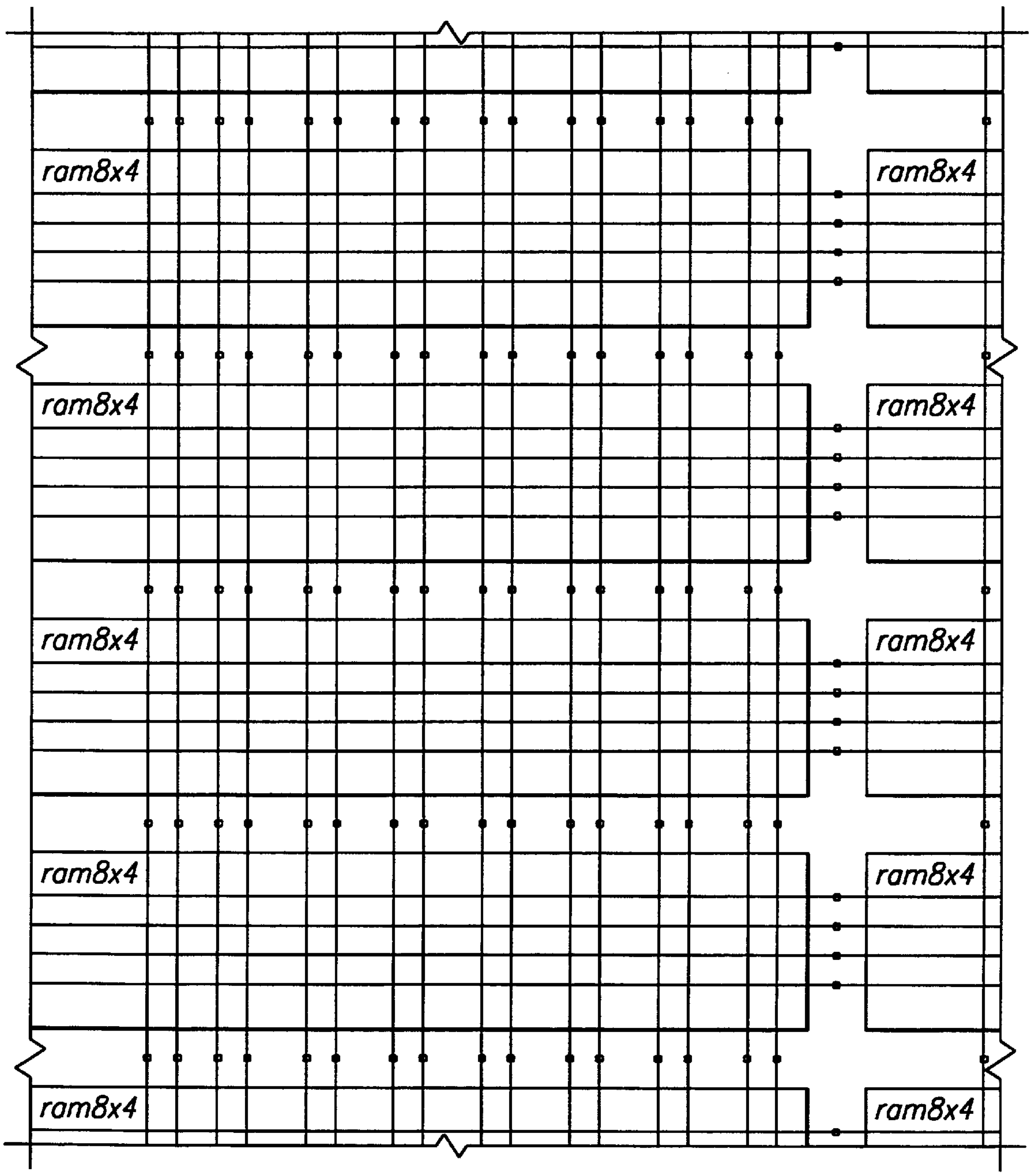
Fig. 7.03CB

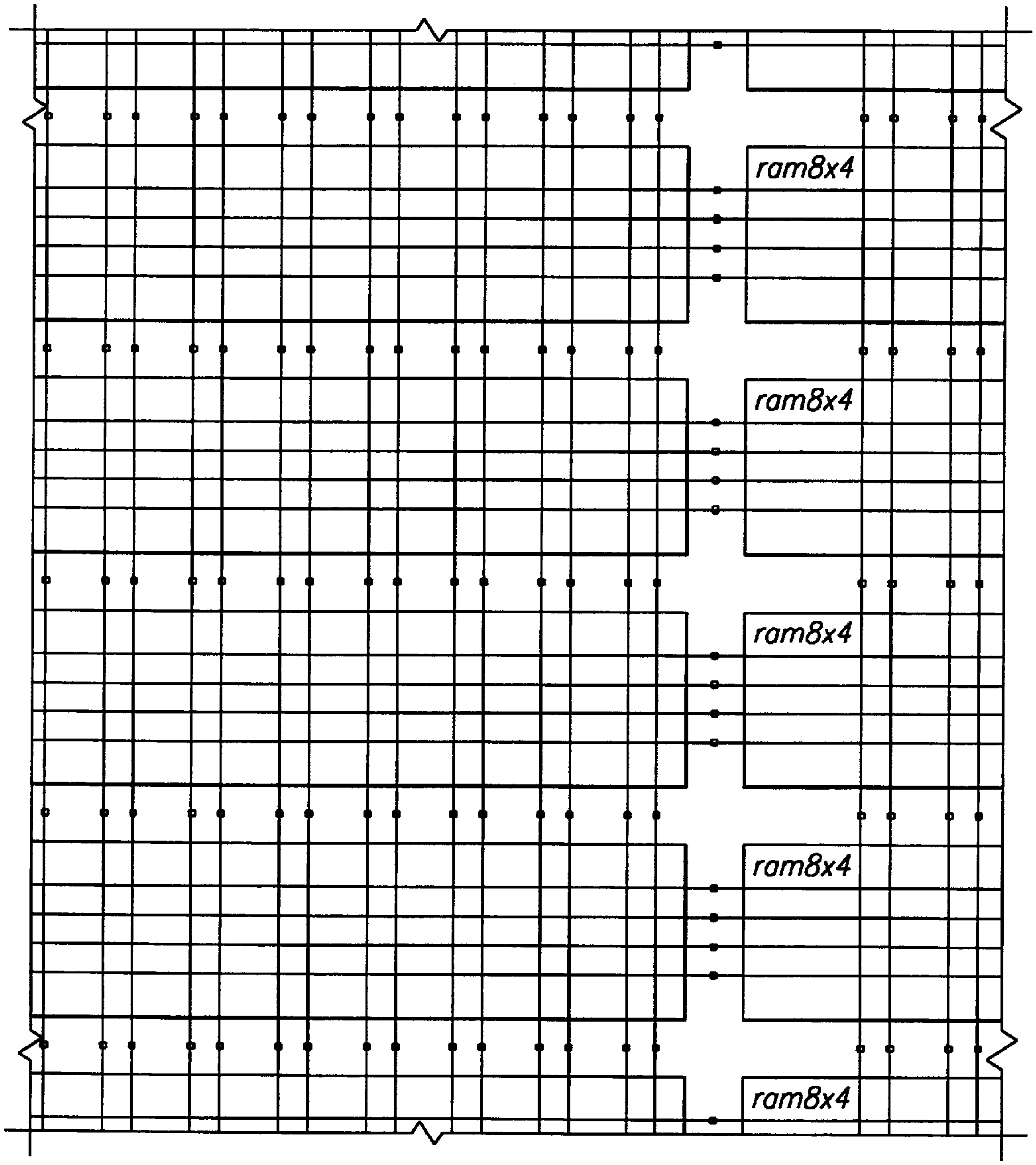
Fig 1.03CC

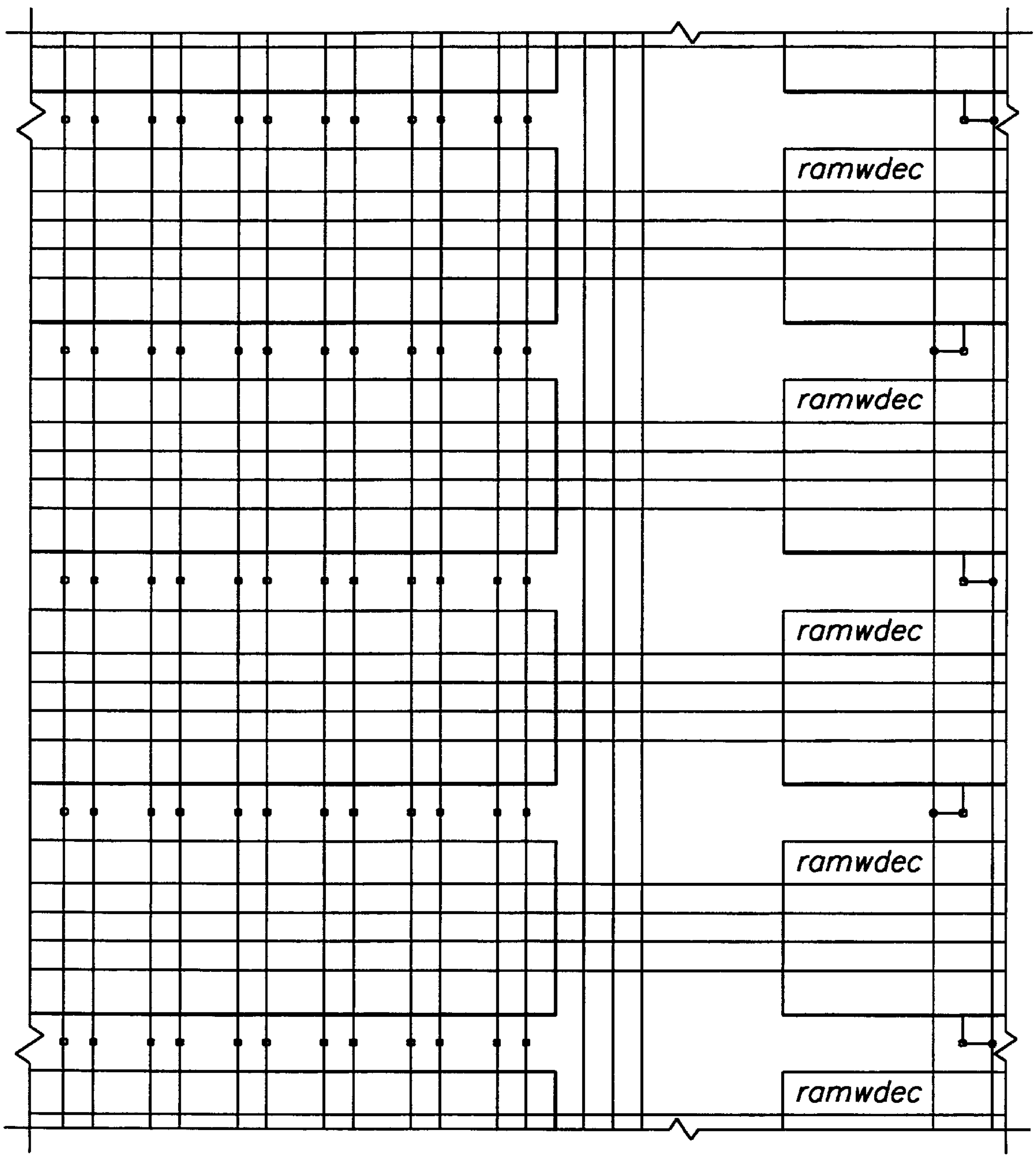
Fig 7.03CD

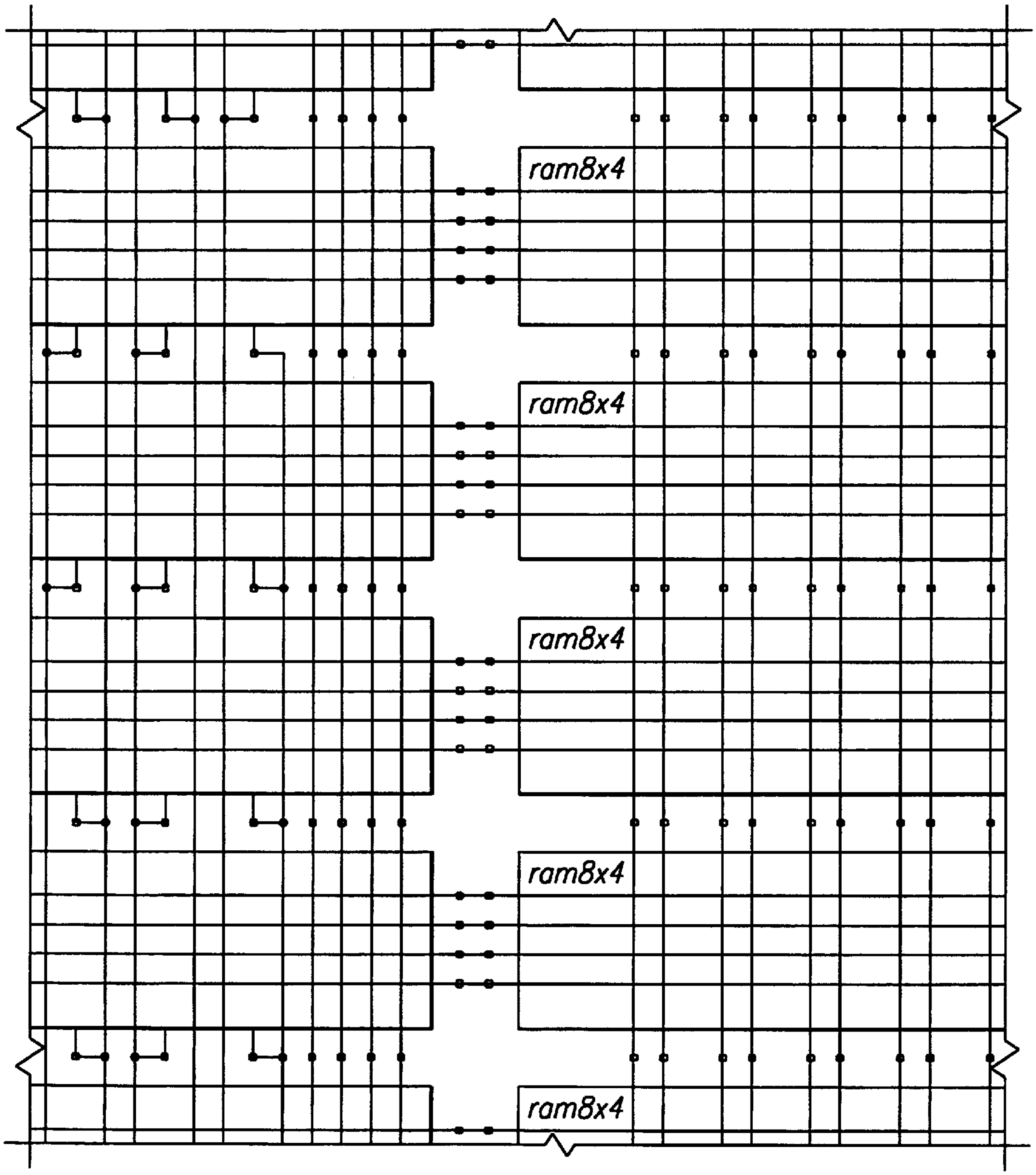
Fig 7.03CE

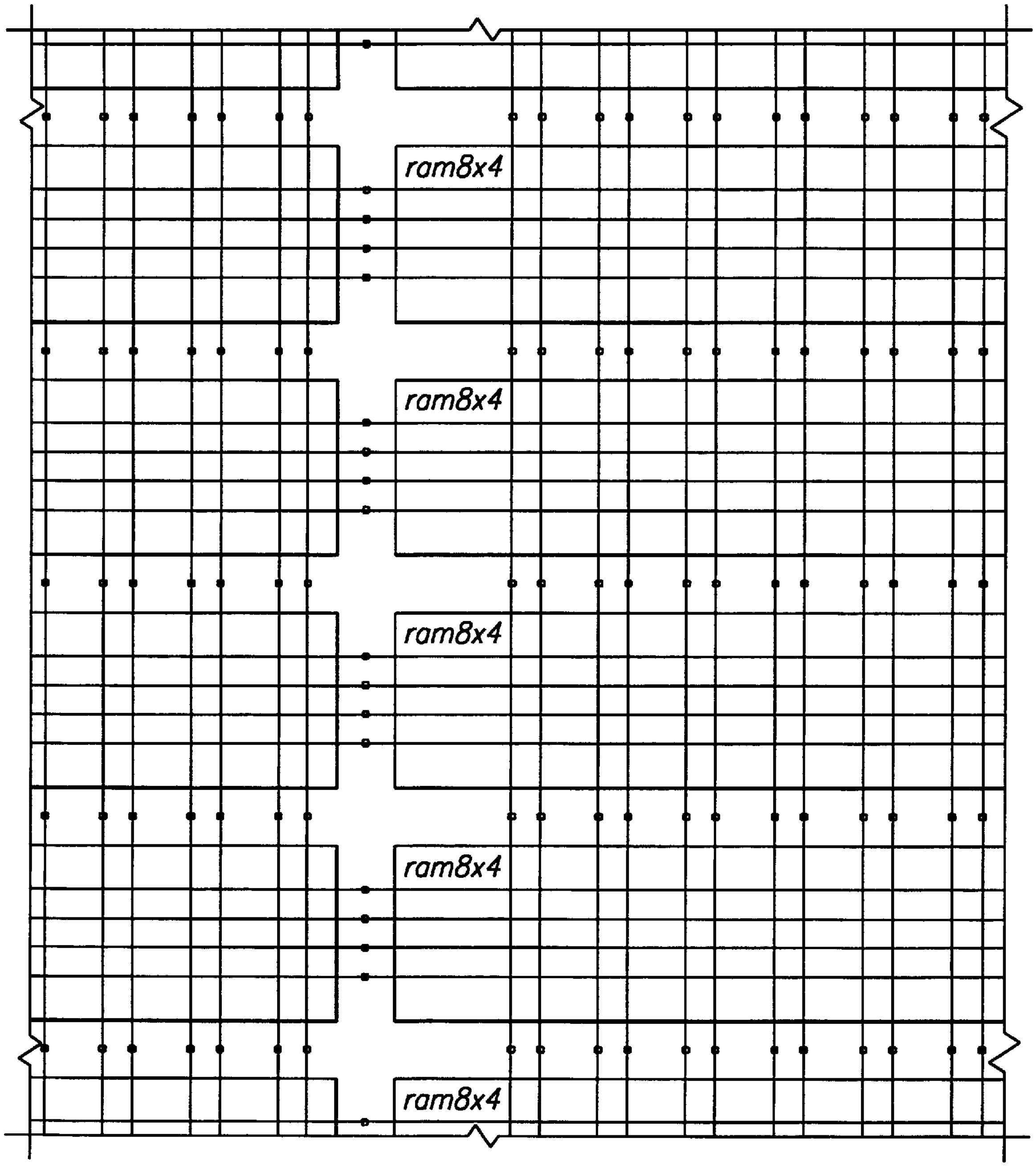
Fig. 7.03CF

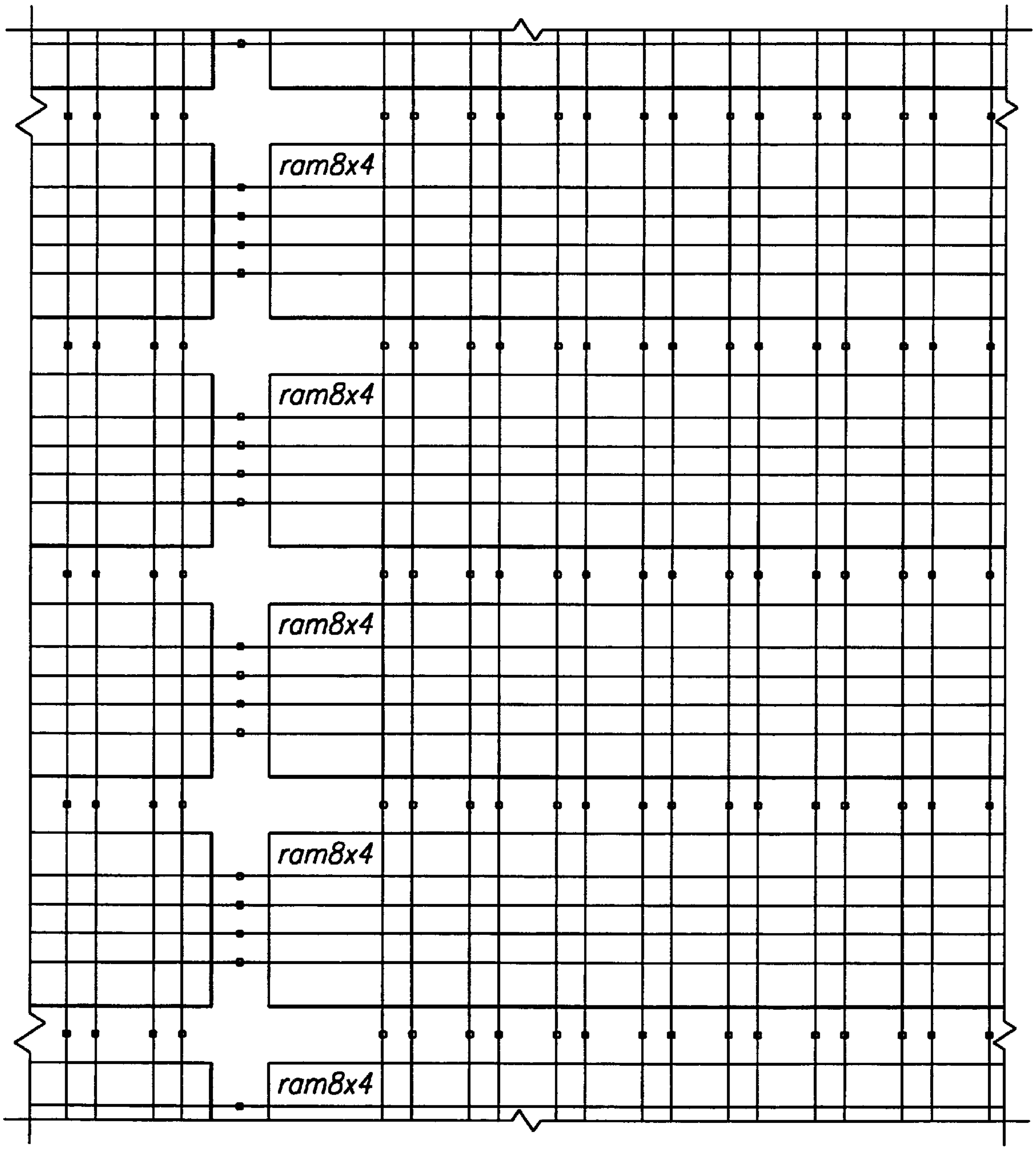
Fig 1.03CG

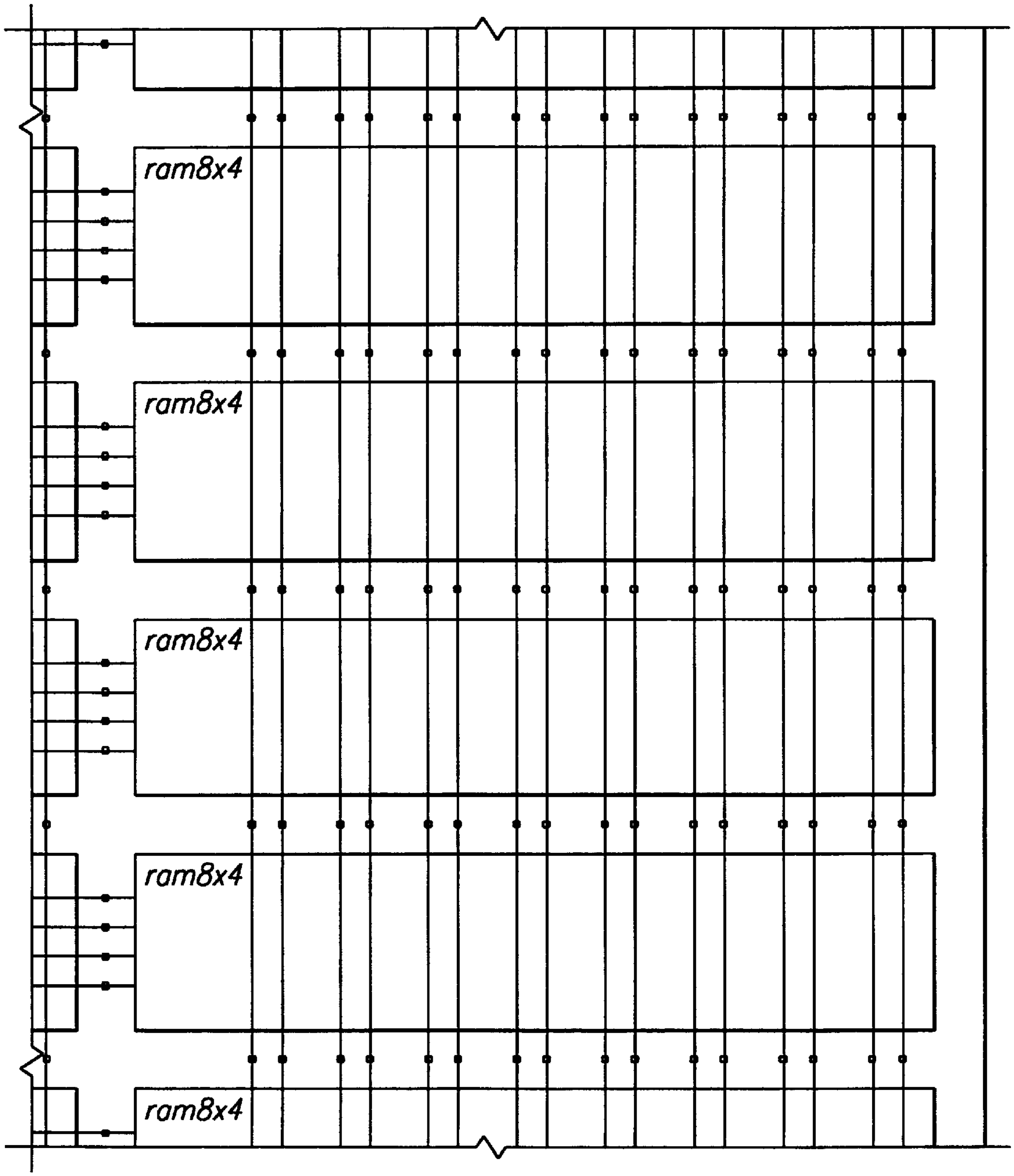
Fig 7.03CH

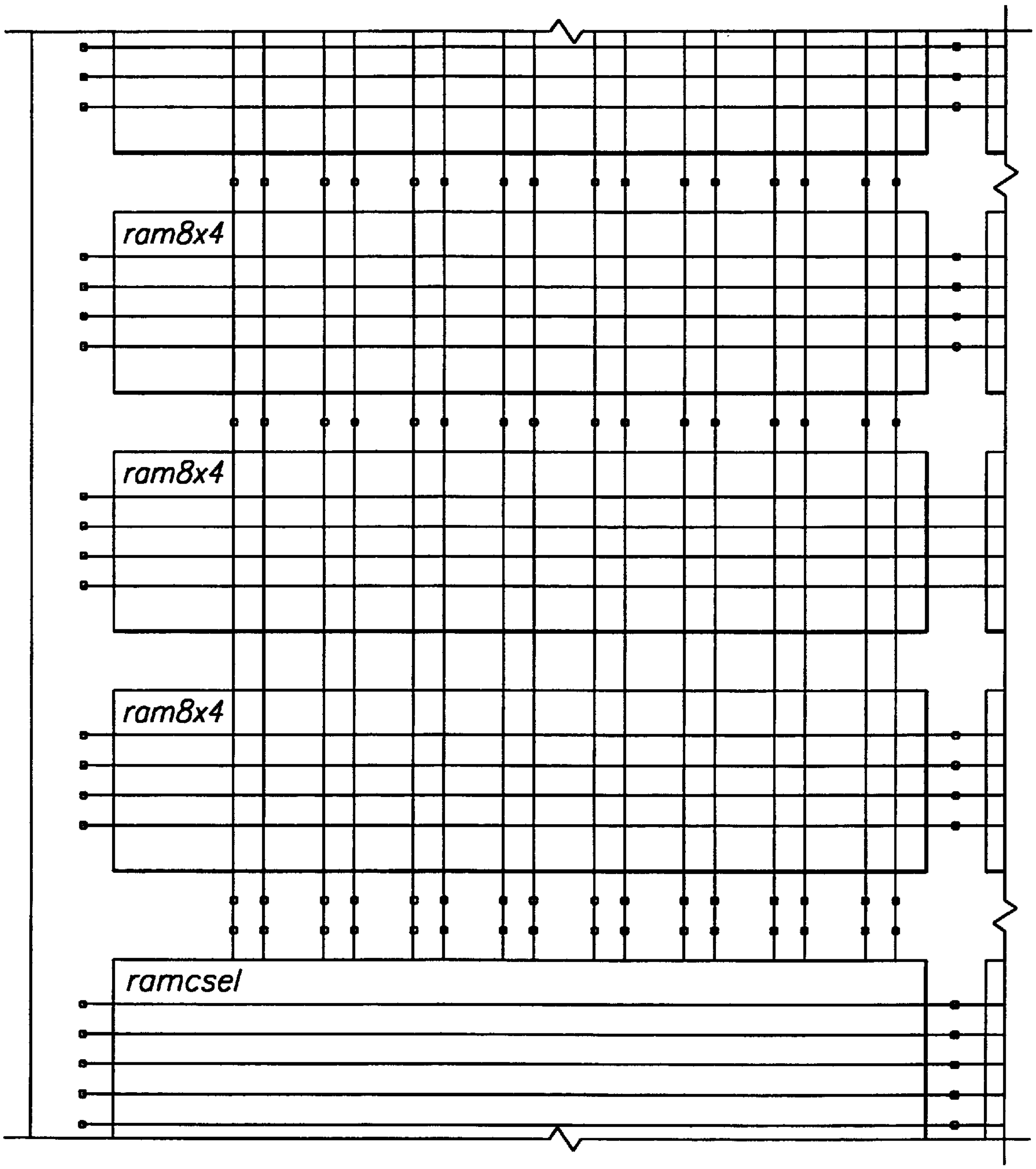
Fig 7.03DA

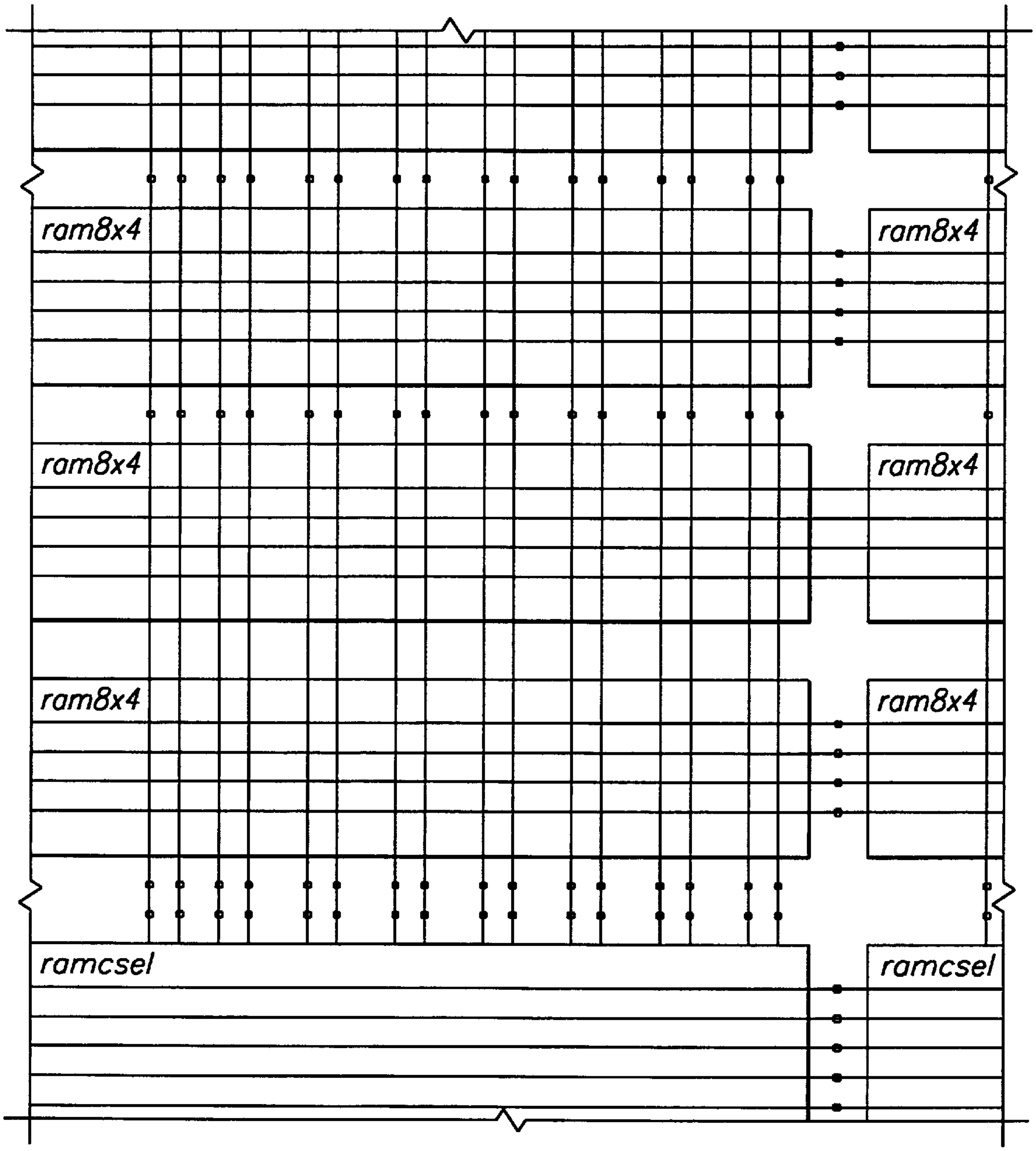
Fig 7.03DB

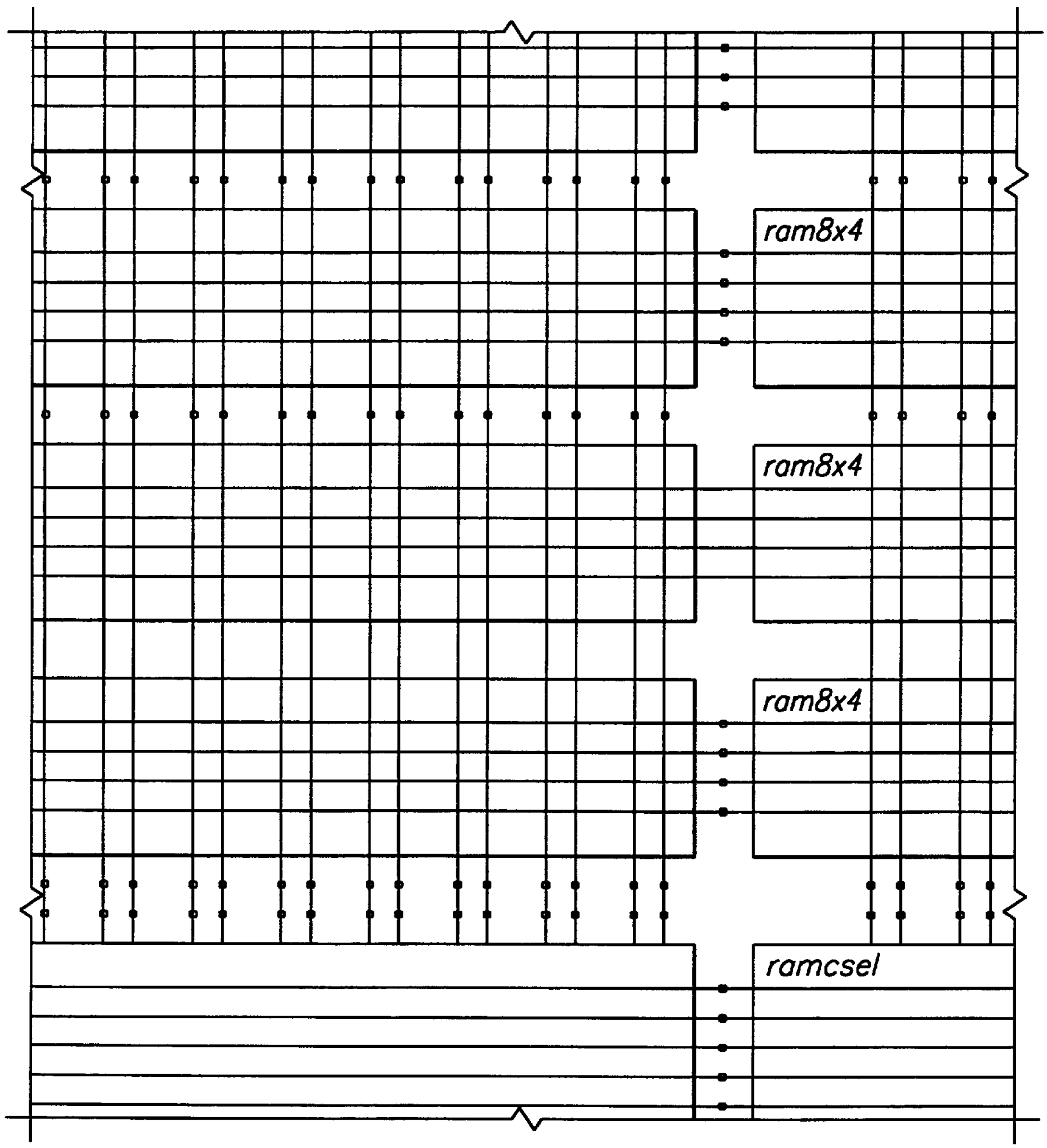
FIG. 7.03DC

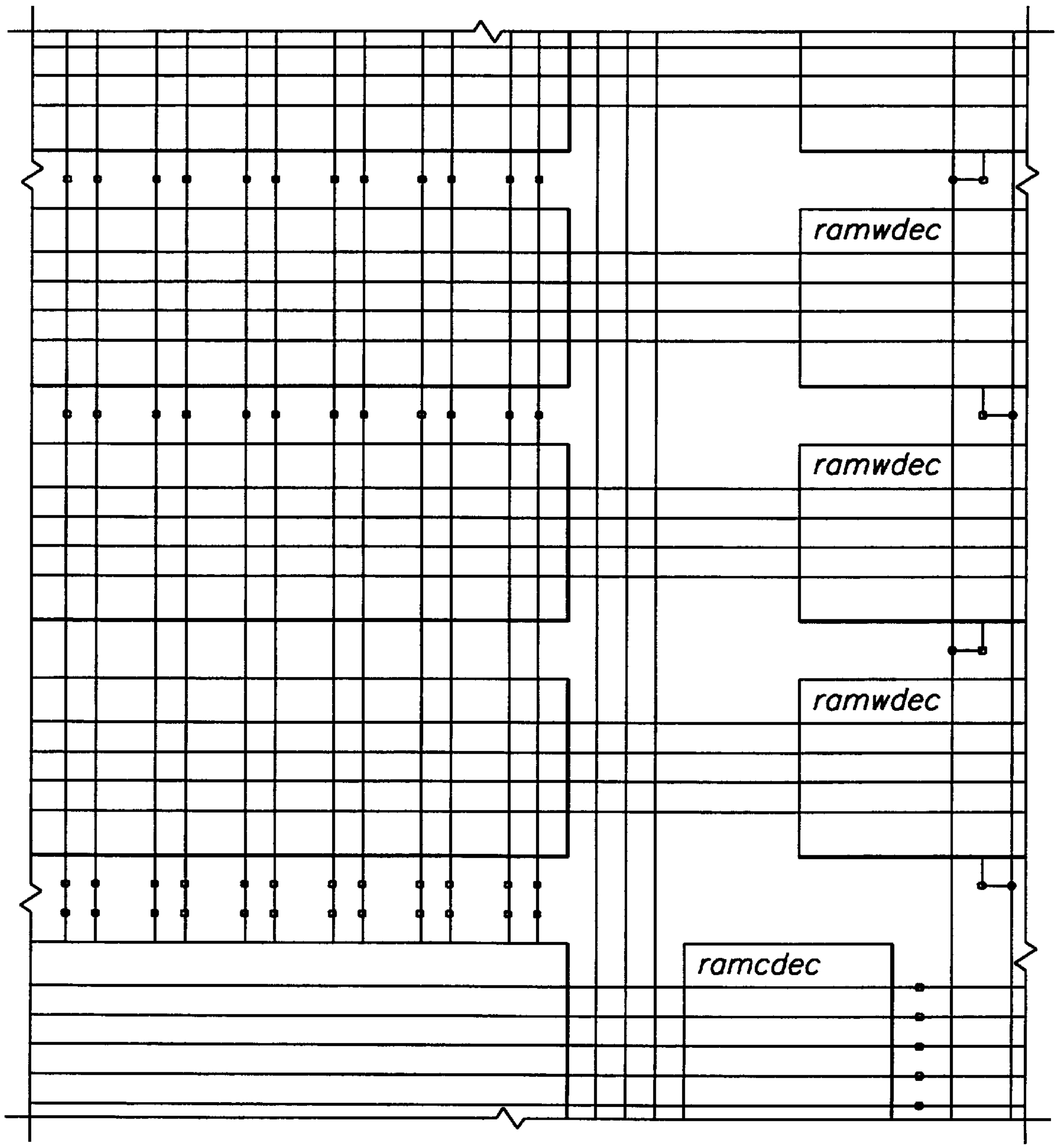
Fig 7.03DD

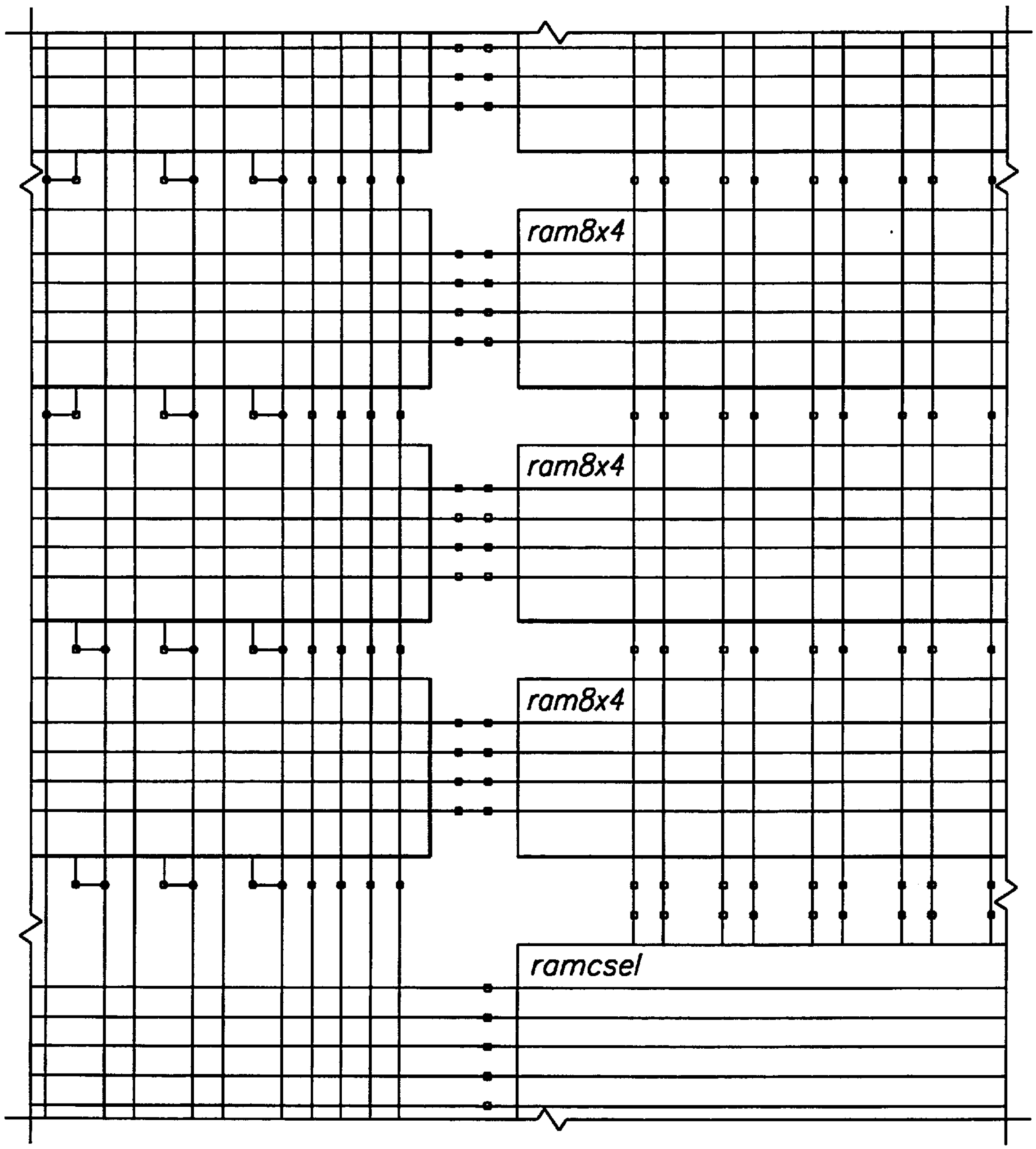
Fig. 7.03DE

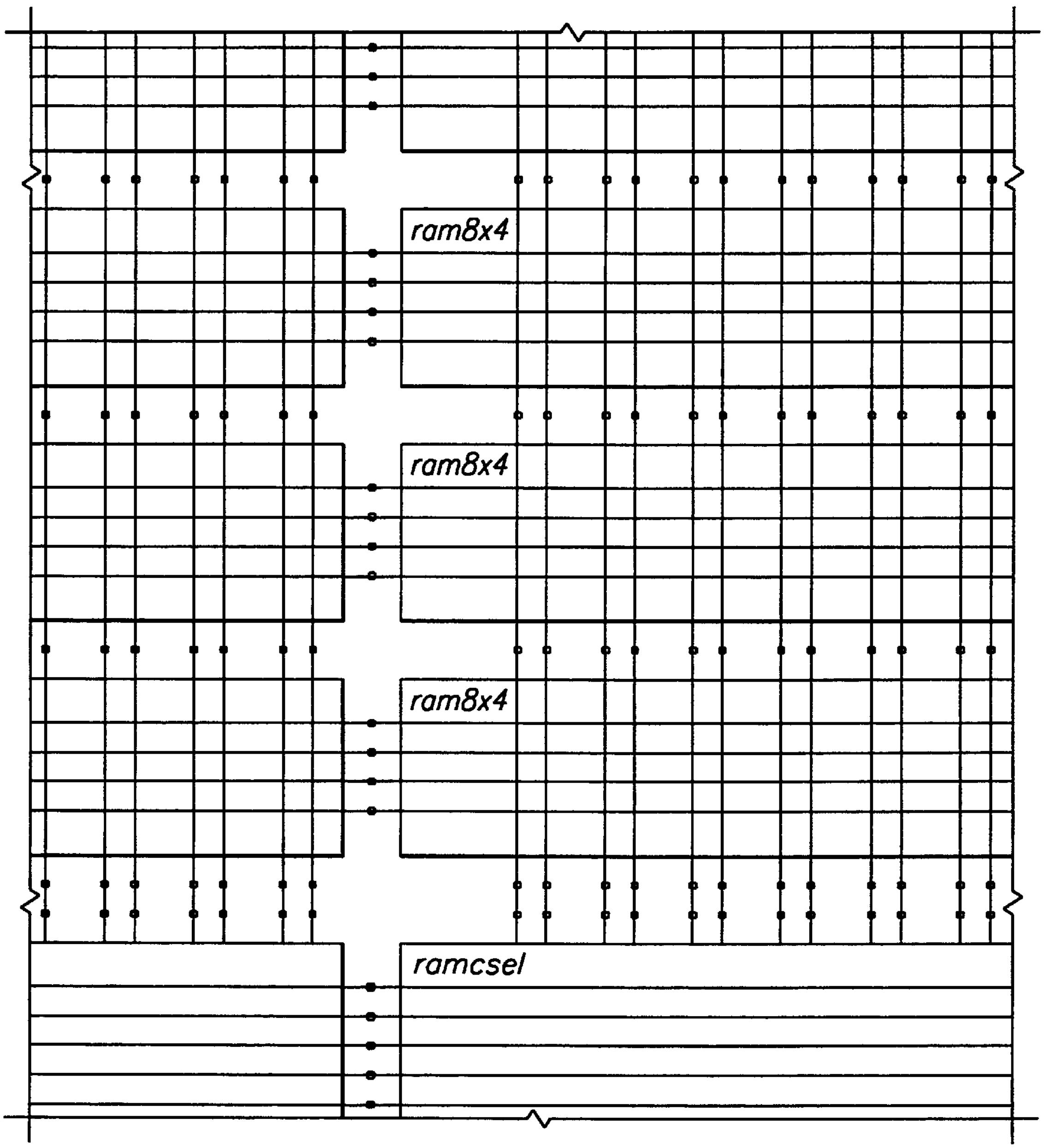
Fig 7.03DF

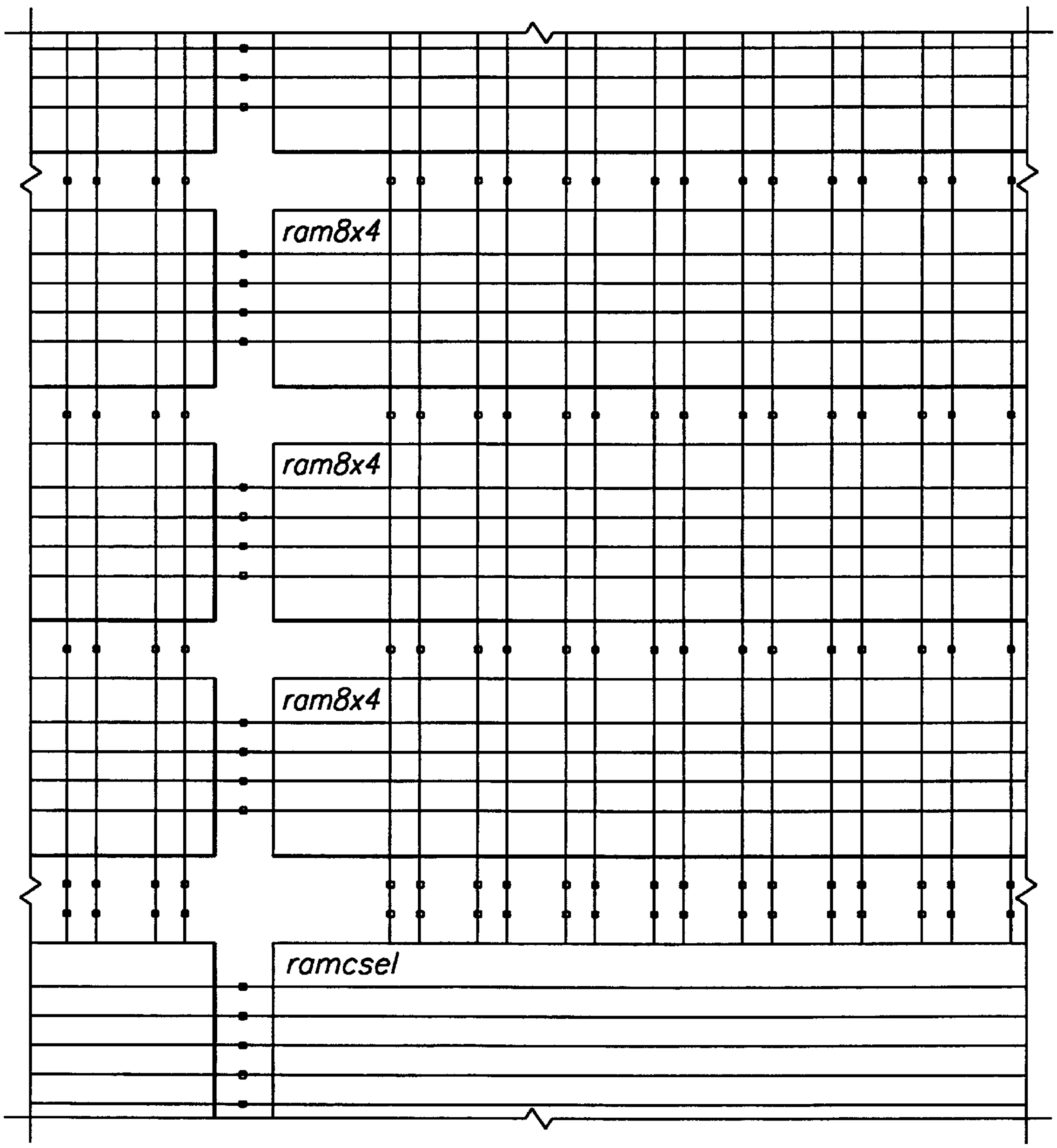
Fig 7.03DG

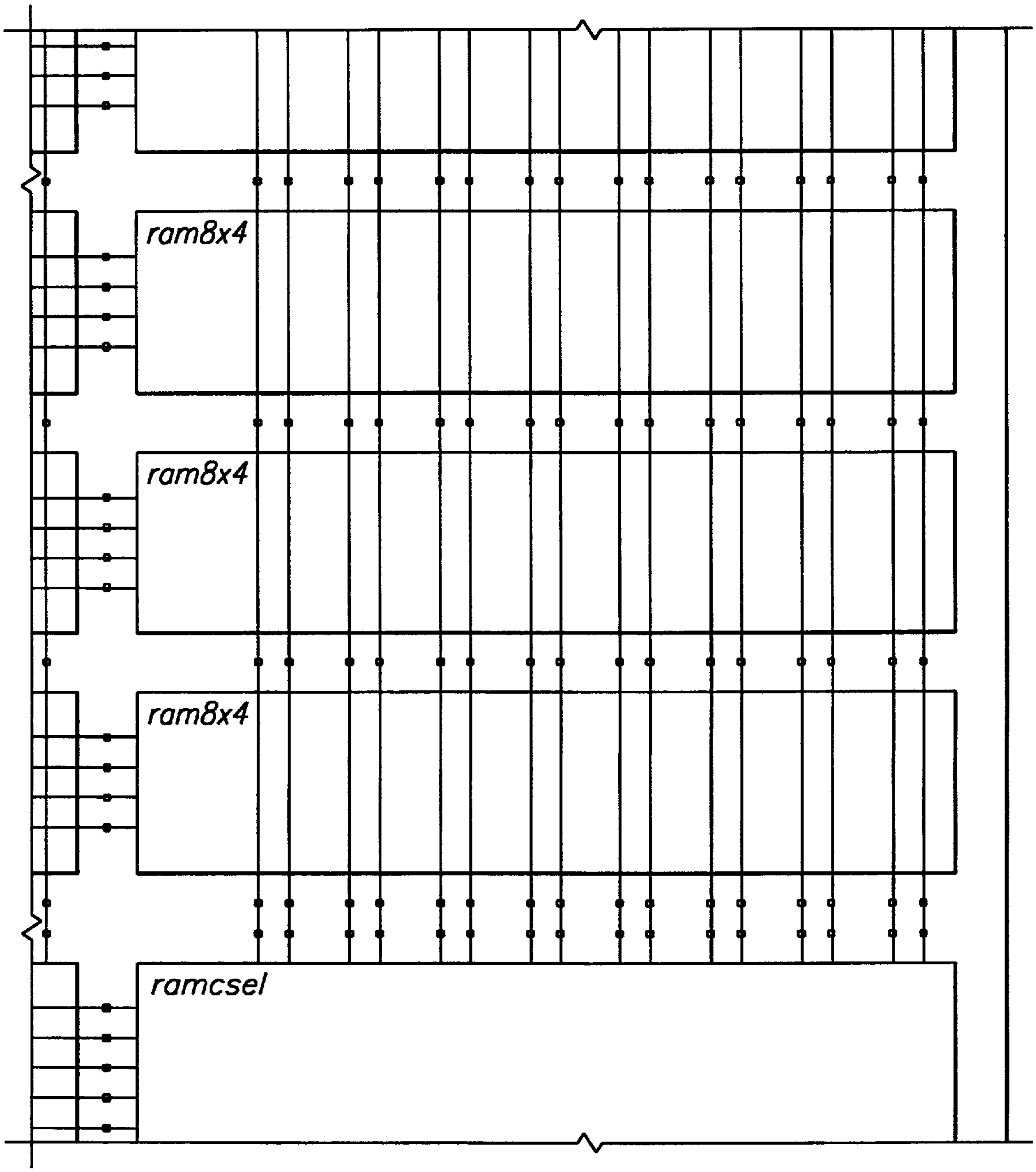
FIG. 7.03DH

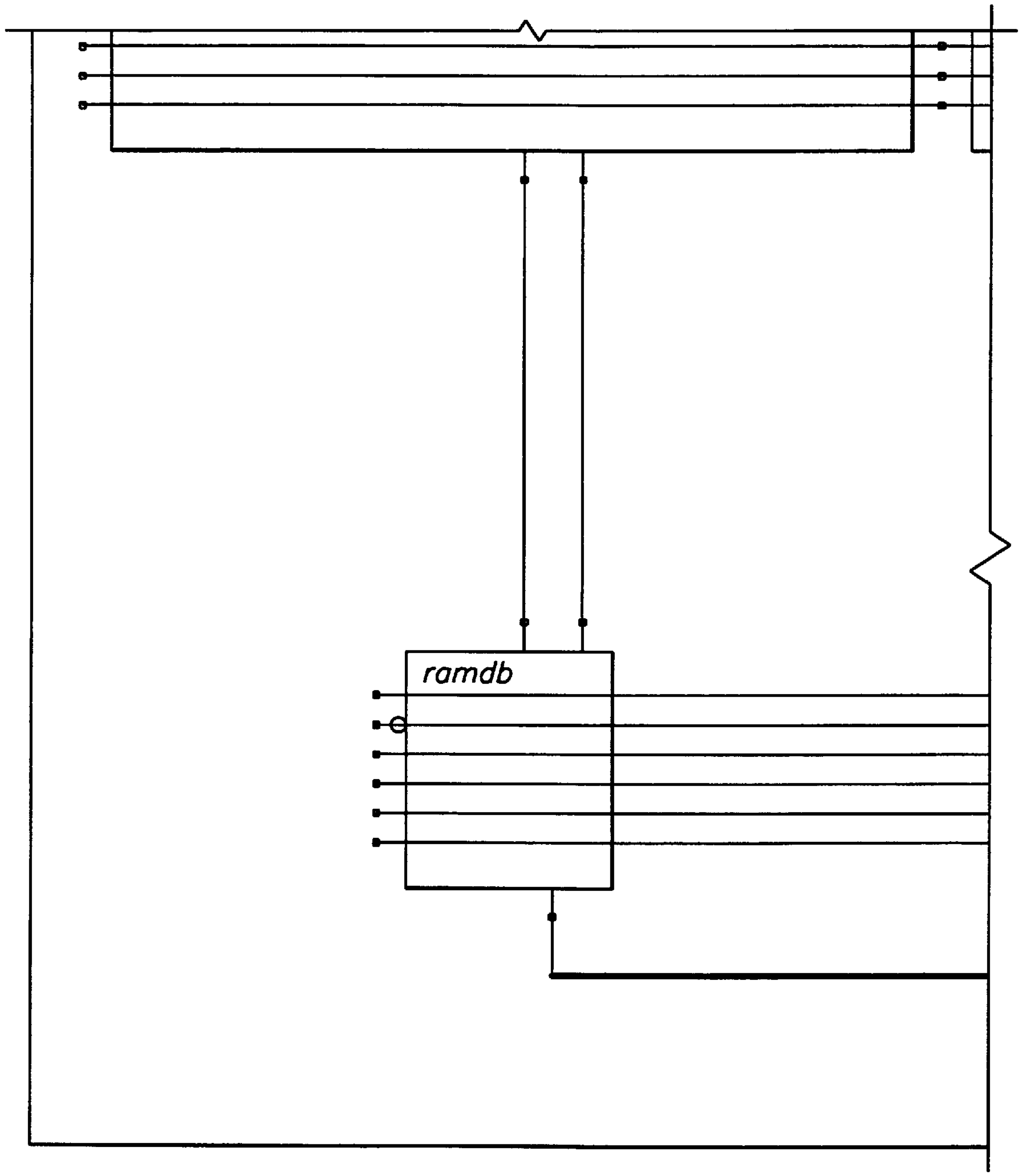
Fig 7.03EA

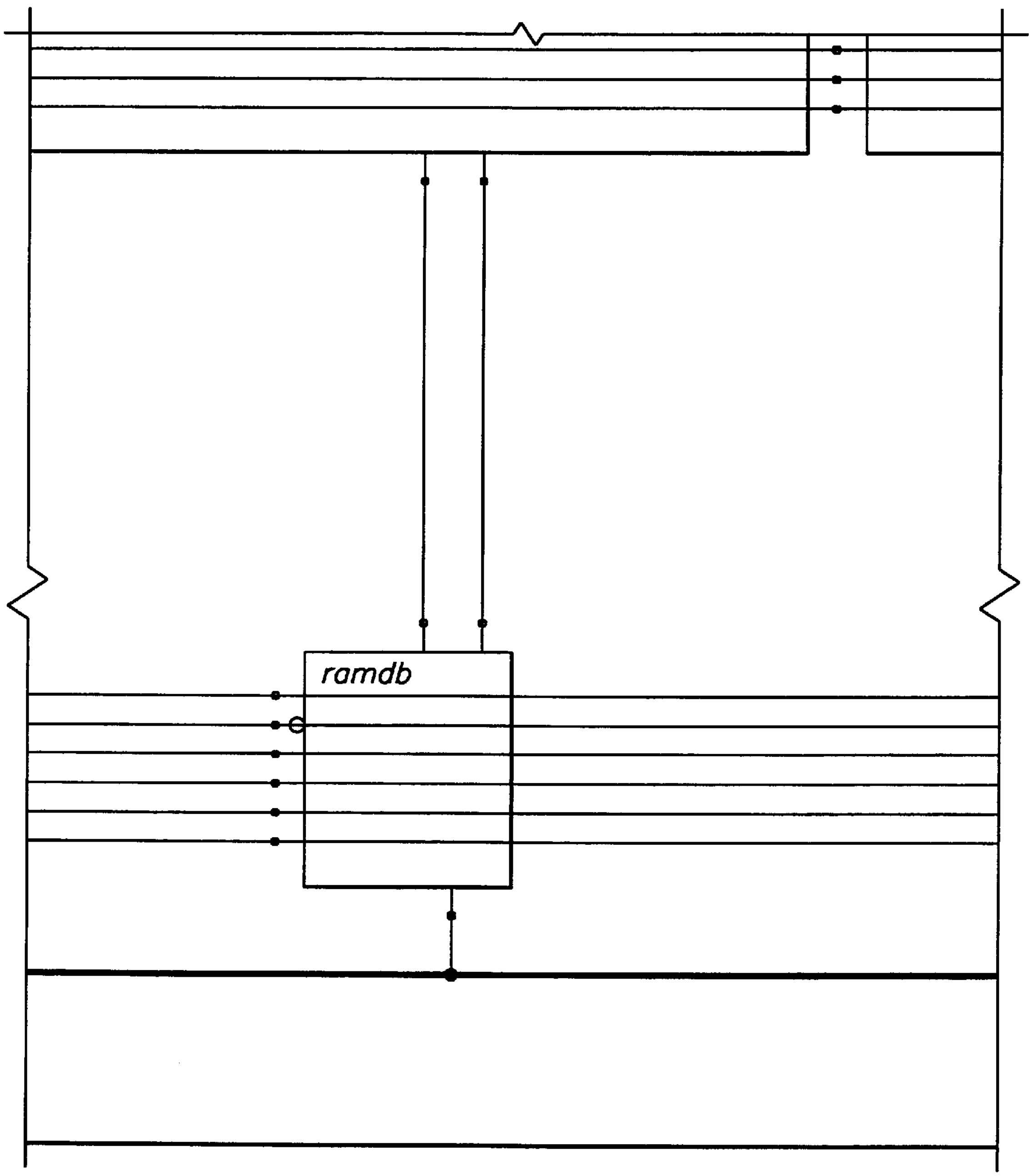
Fig 7.03EB

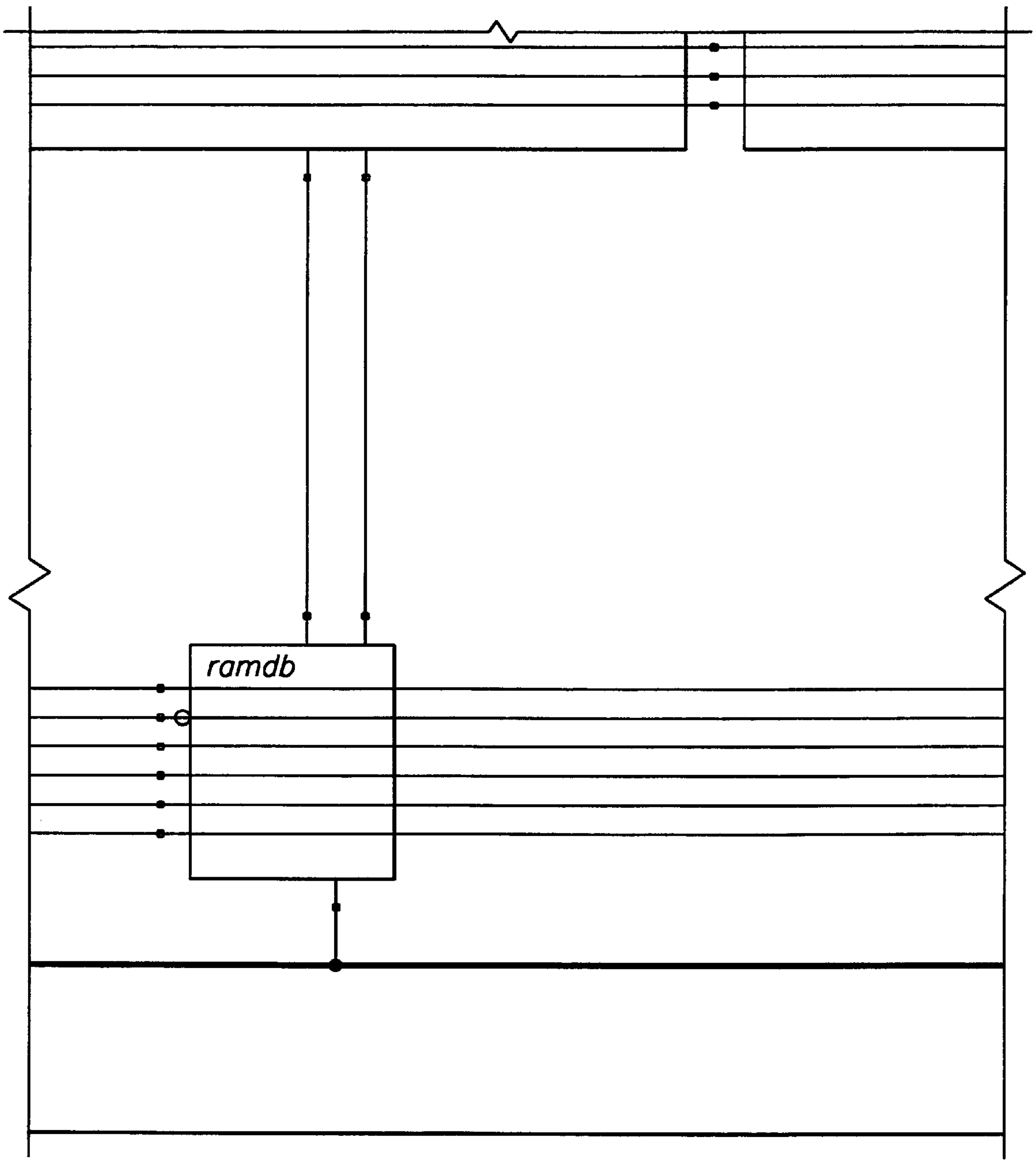
Fig 7.03EC

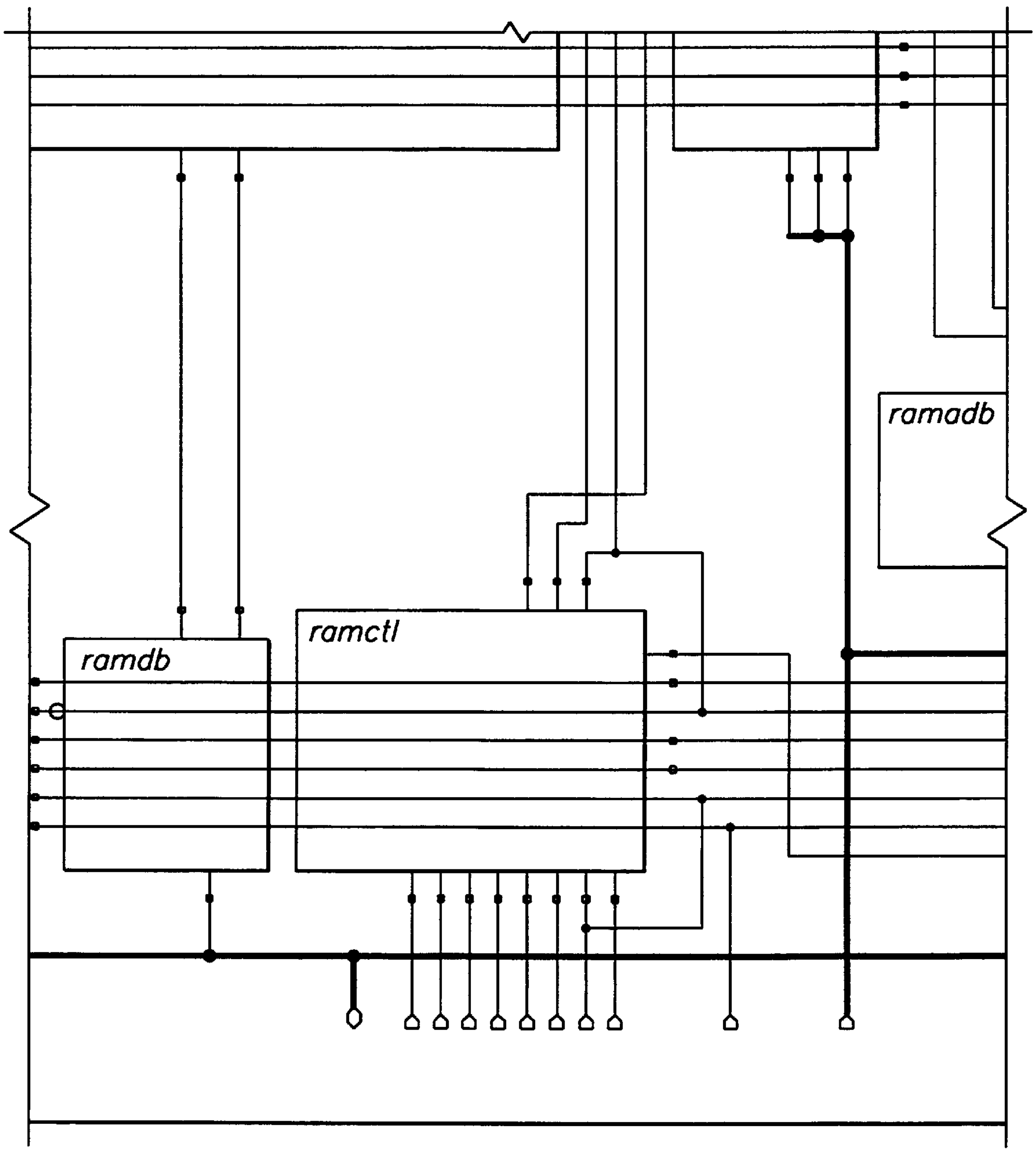
Fig 7.03ED

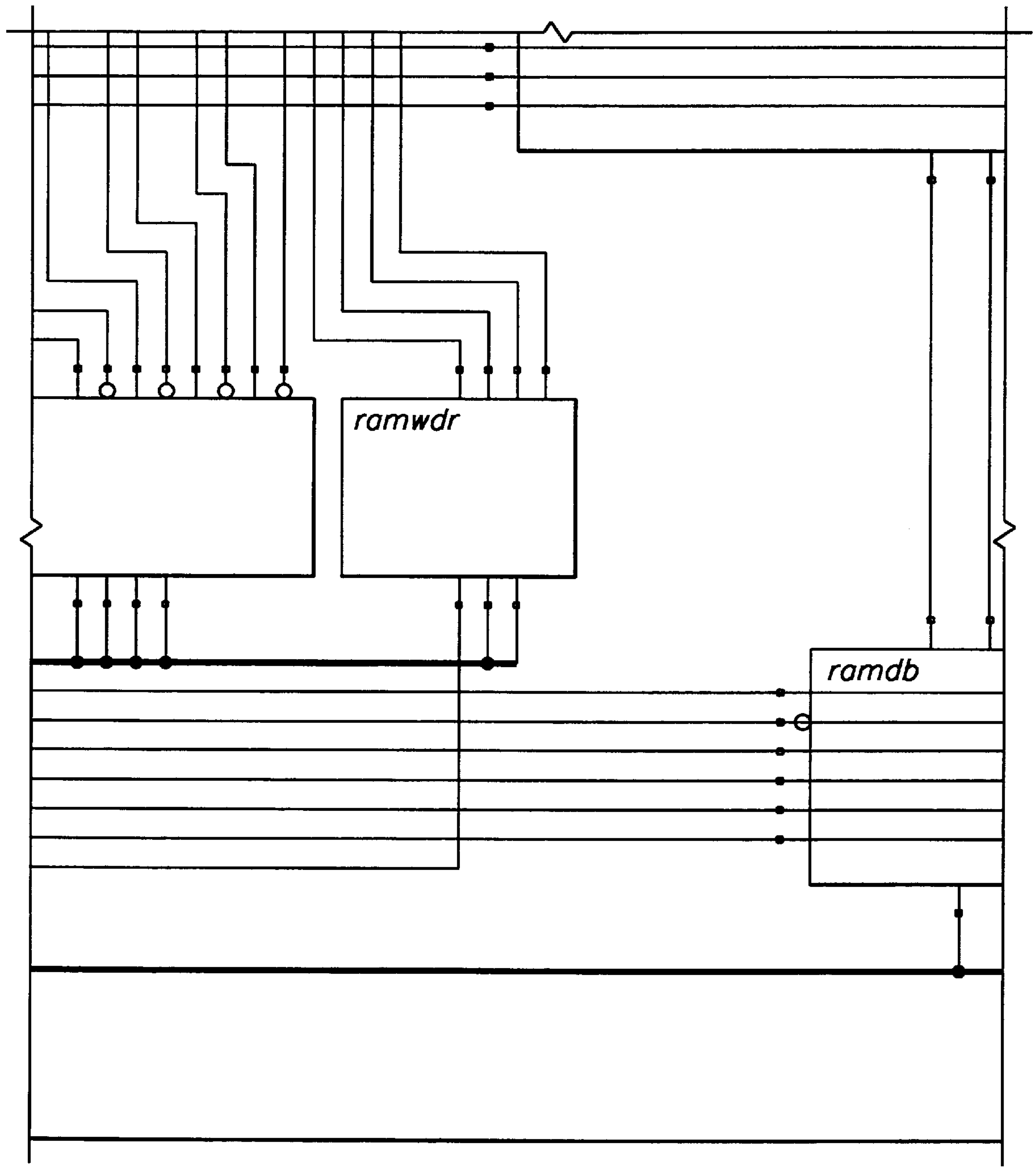
Fig 1.03EE

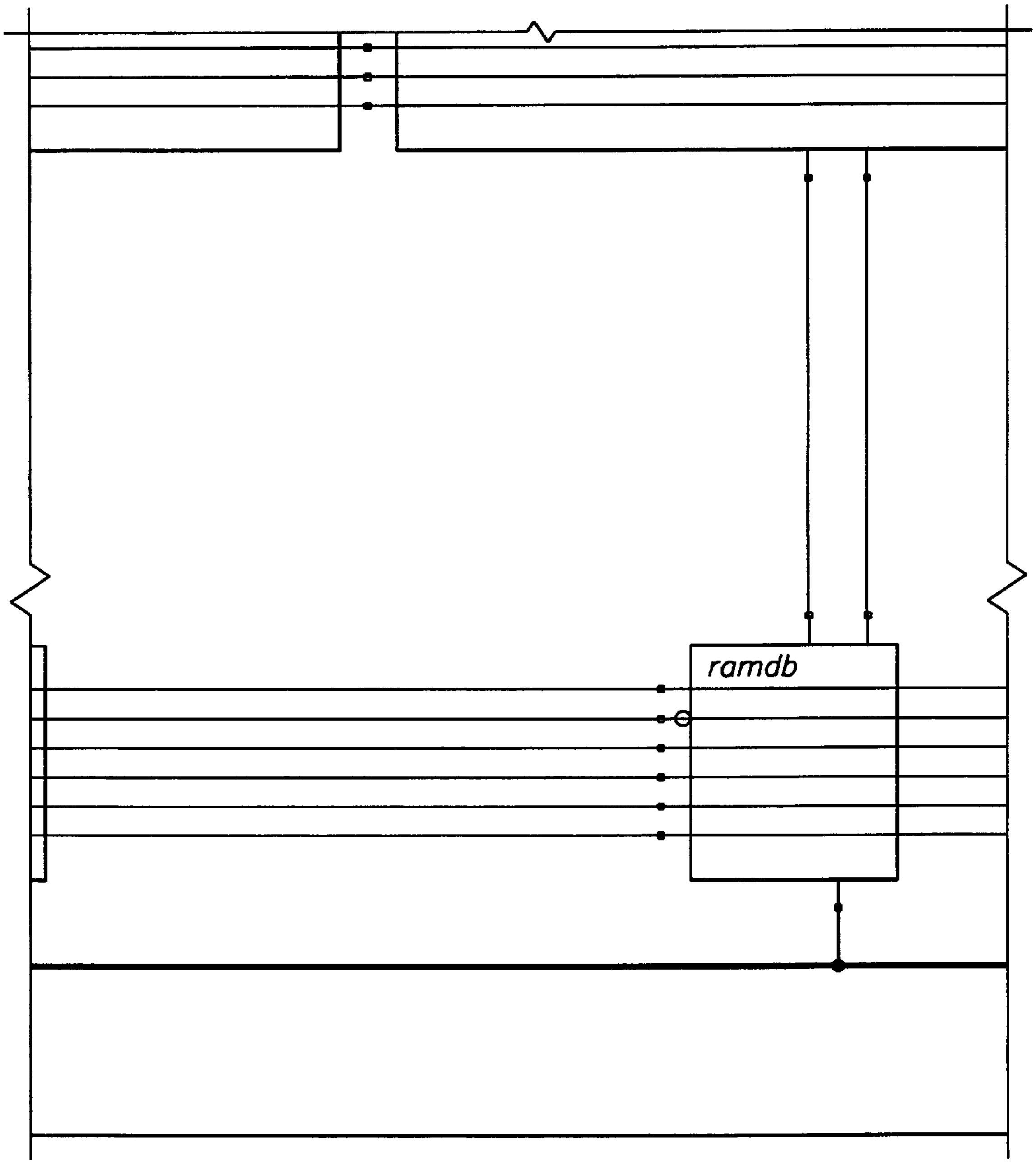
Fig 7.03EF

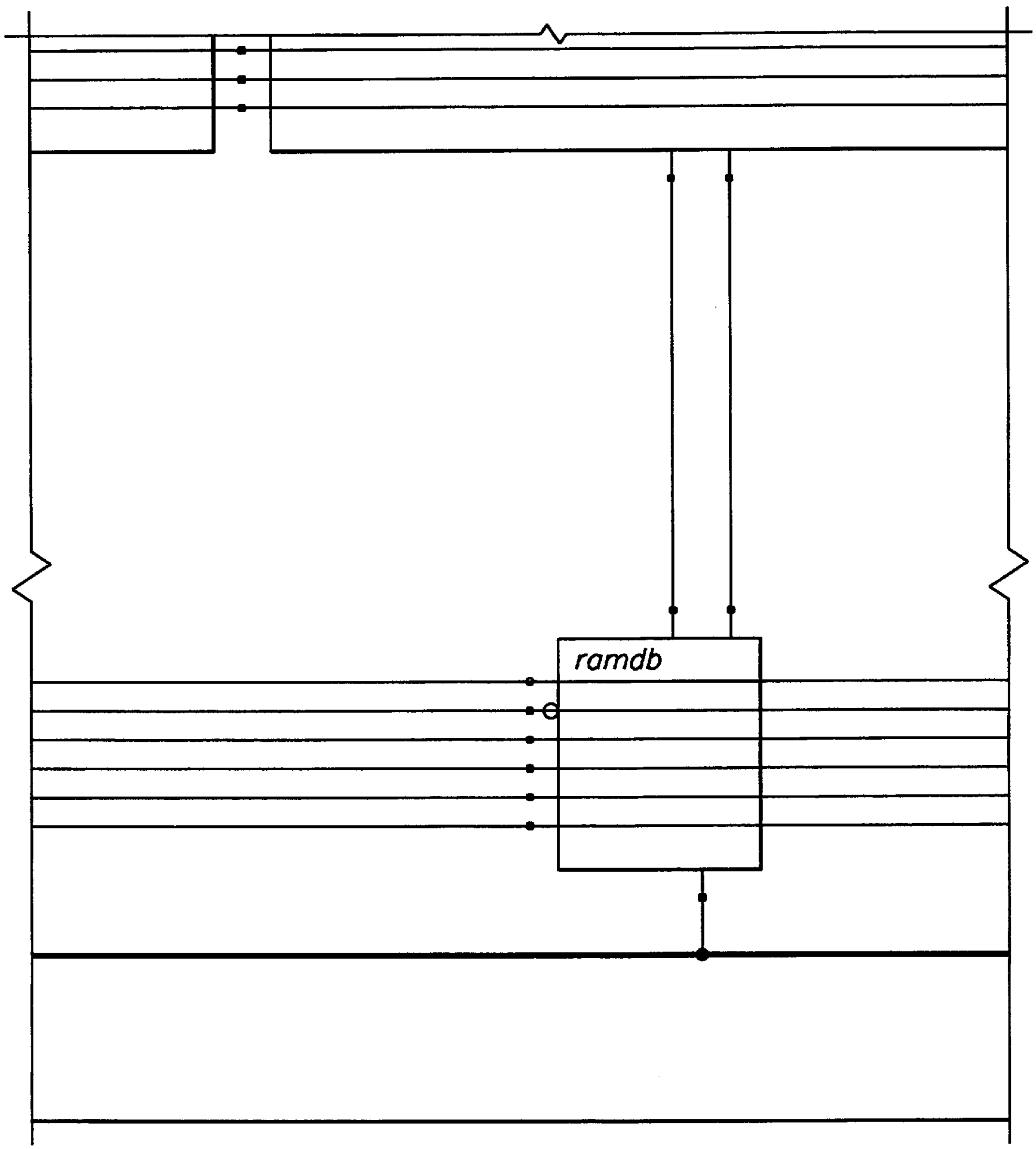
Fig 7.03EG

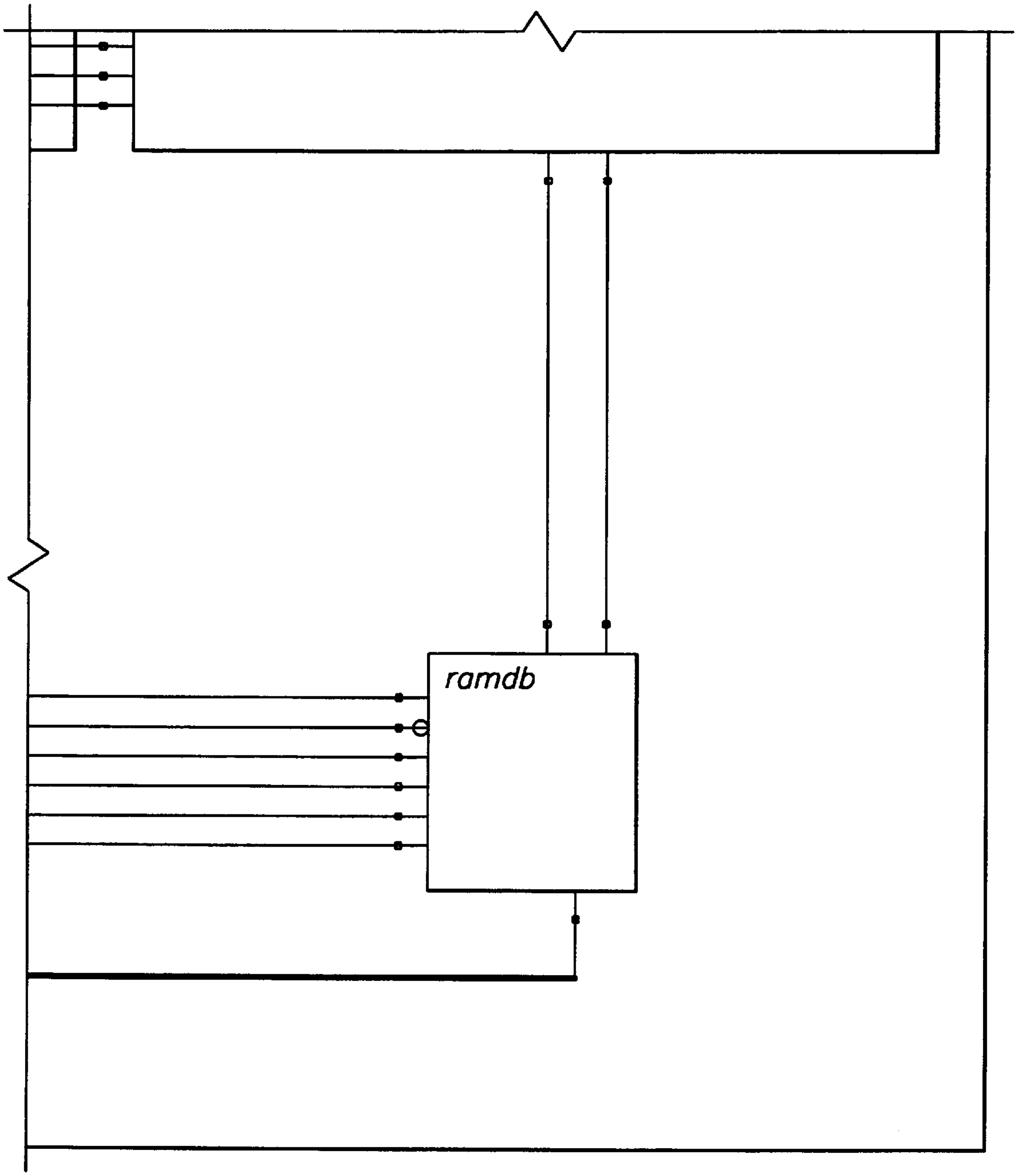
Fig 7.03EH

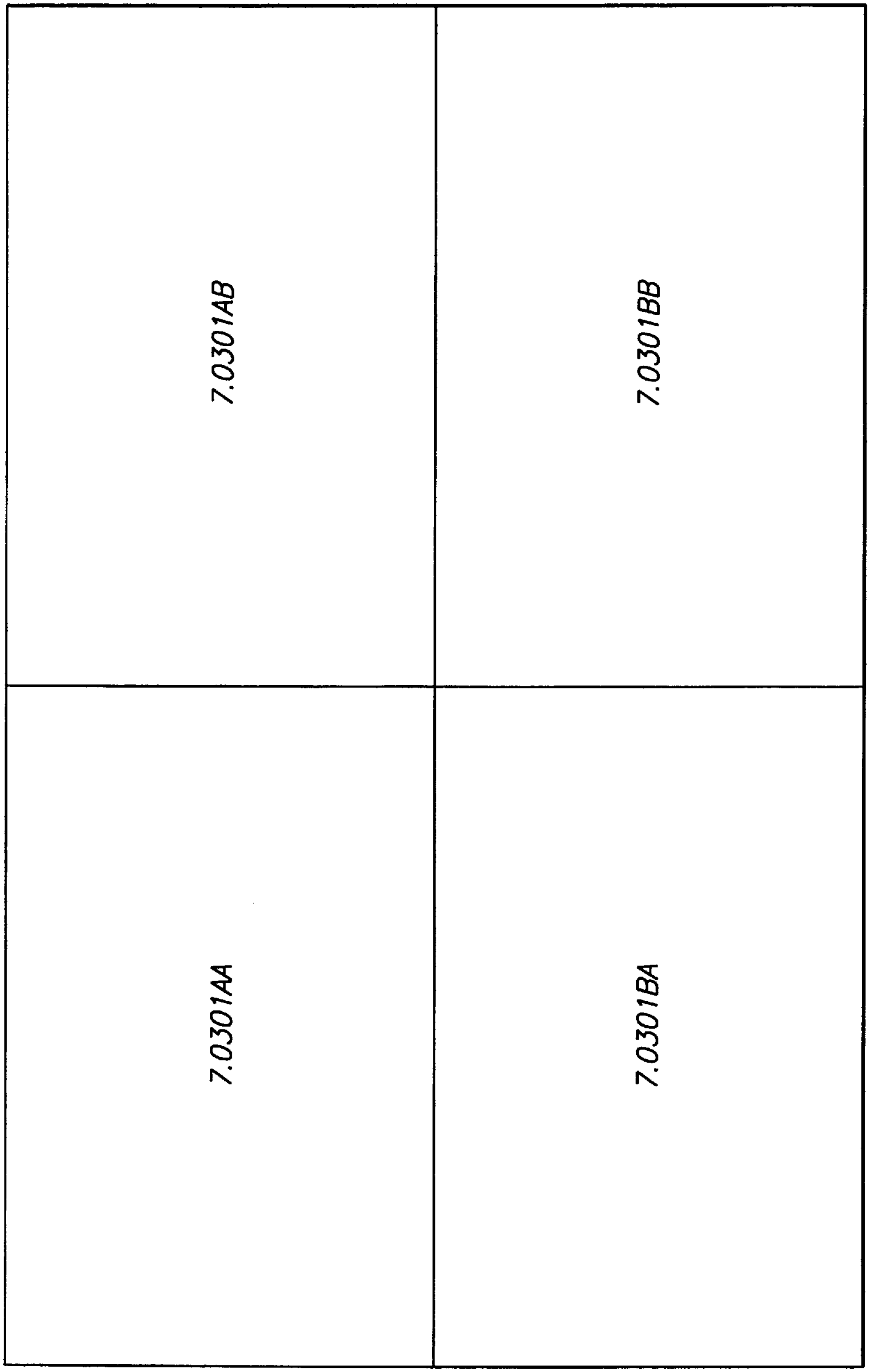
FIG. 7.0301

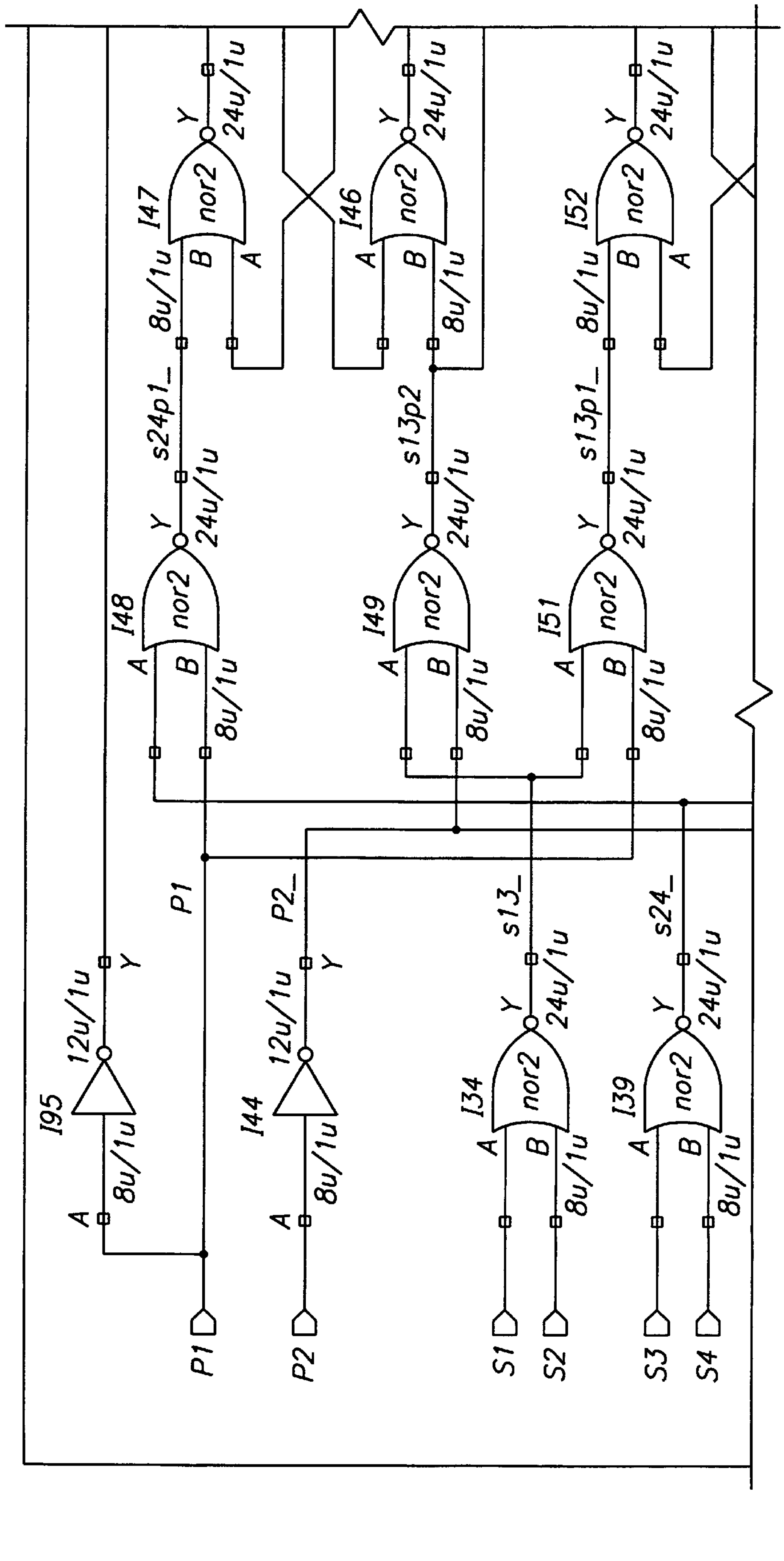
Fig. 7.0E0I.8A

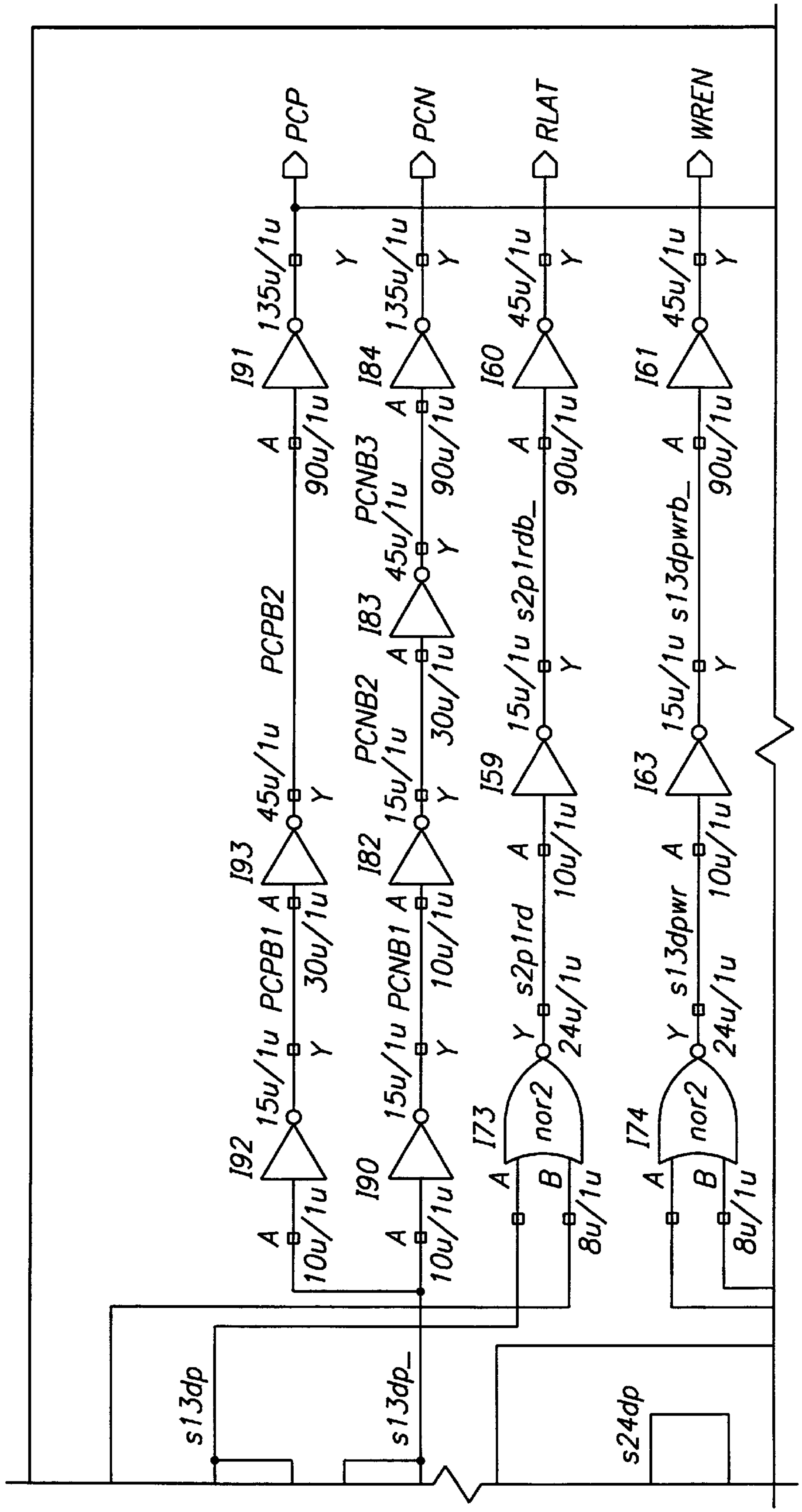
PCP
PCN
RLAT
WREN
I91
I84
I60
I61
I93
I83
I59
I63
I92
I82
I90
I73
I74
nor2
nor2
135u/1u
45u/1u
90u/1u
15u/1u
30u/1u
10u/1u
24u/1u
8u/1u
PCPB1
PCPB2
PCNB1
PCNB2
PCNB3
s2p1rd
s2p1rdb_
s13dpwr
s13dpwrb_
s13dp
s13dp_
s24dp

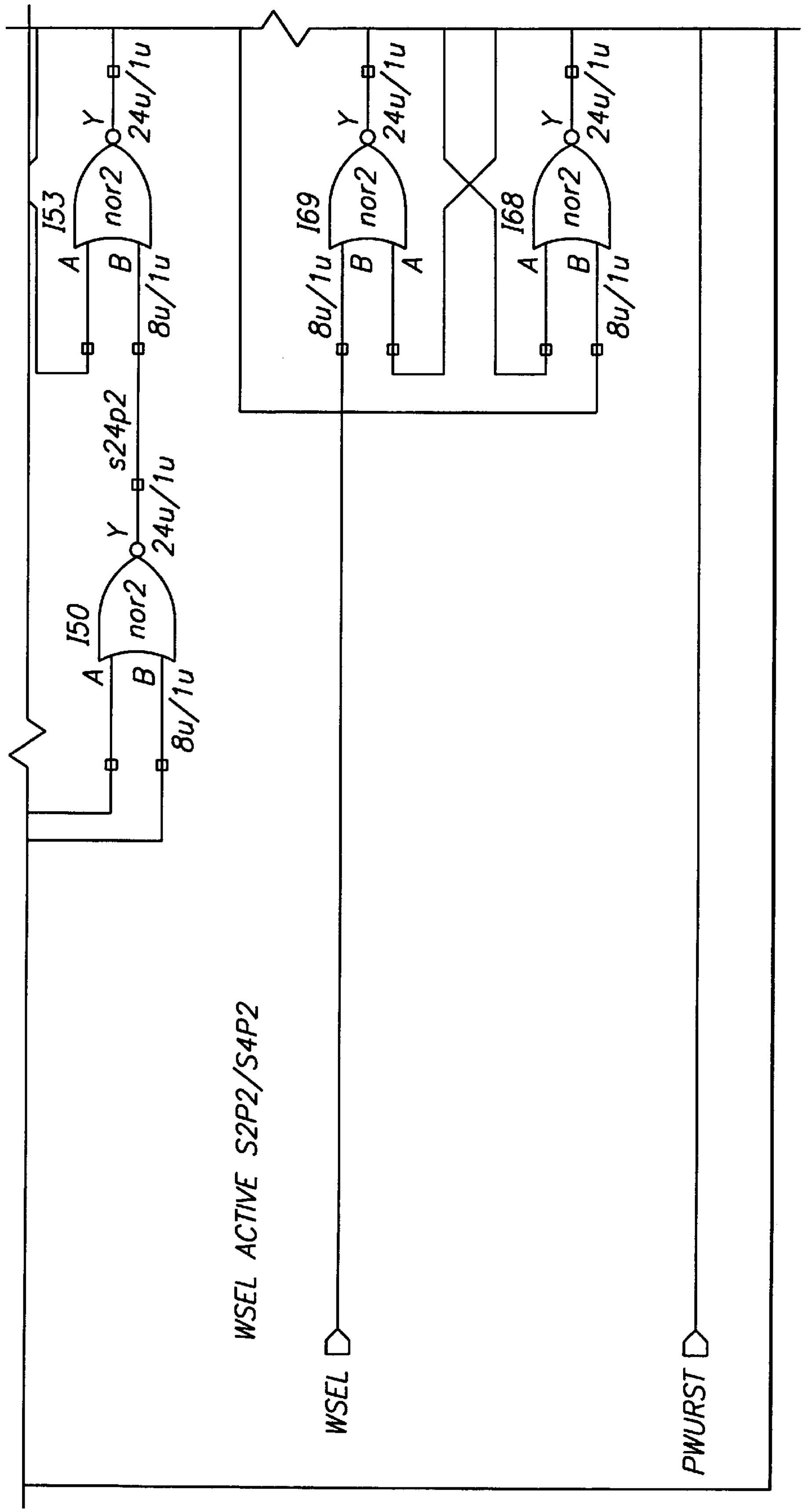
Fig. 7.0E1BA

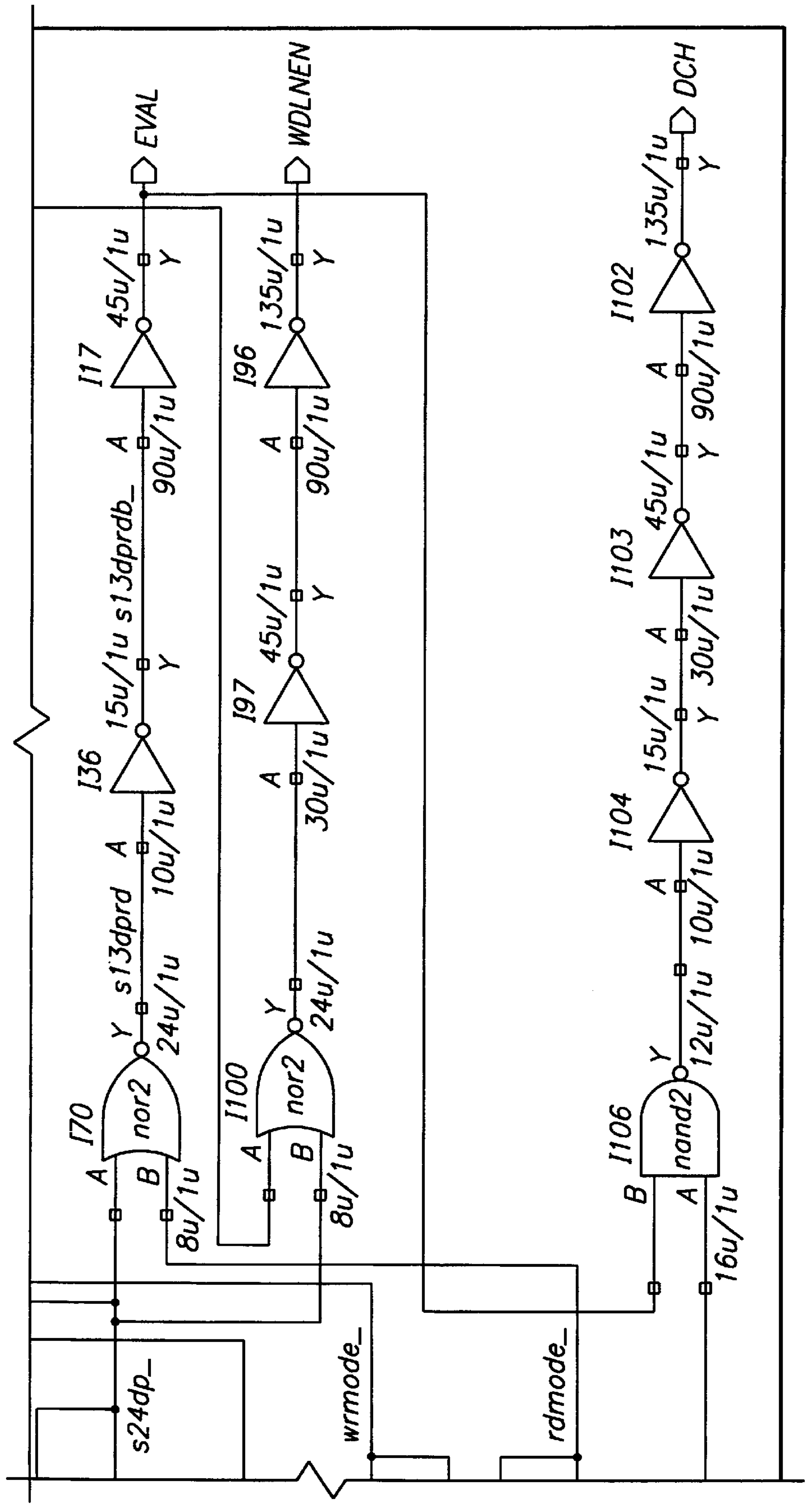
Fig. 7.031BB

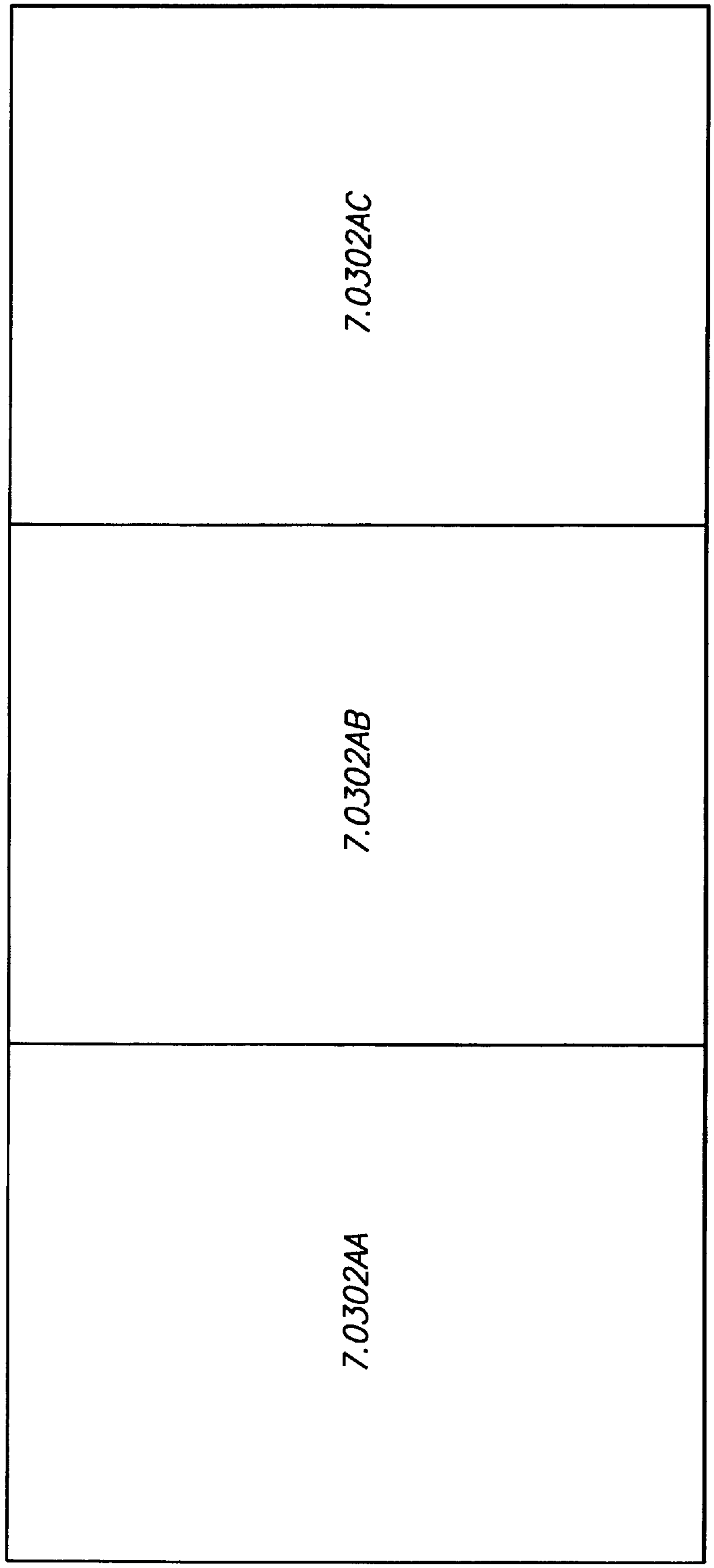
FIG. 7.0302

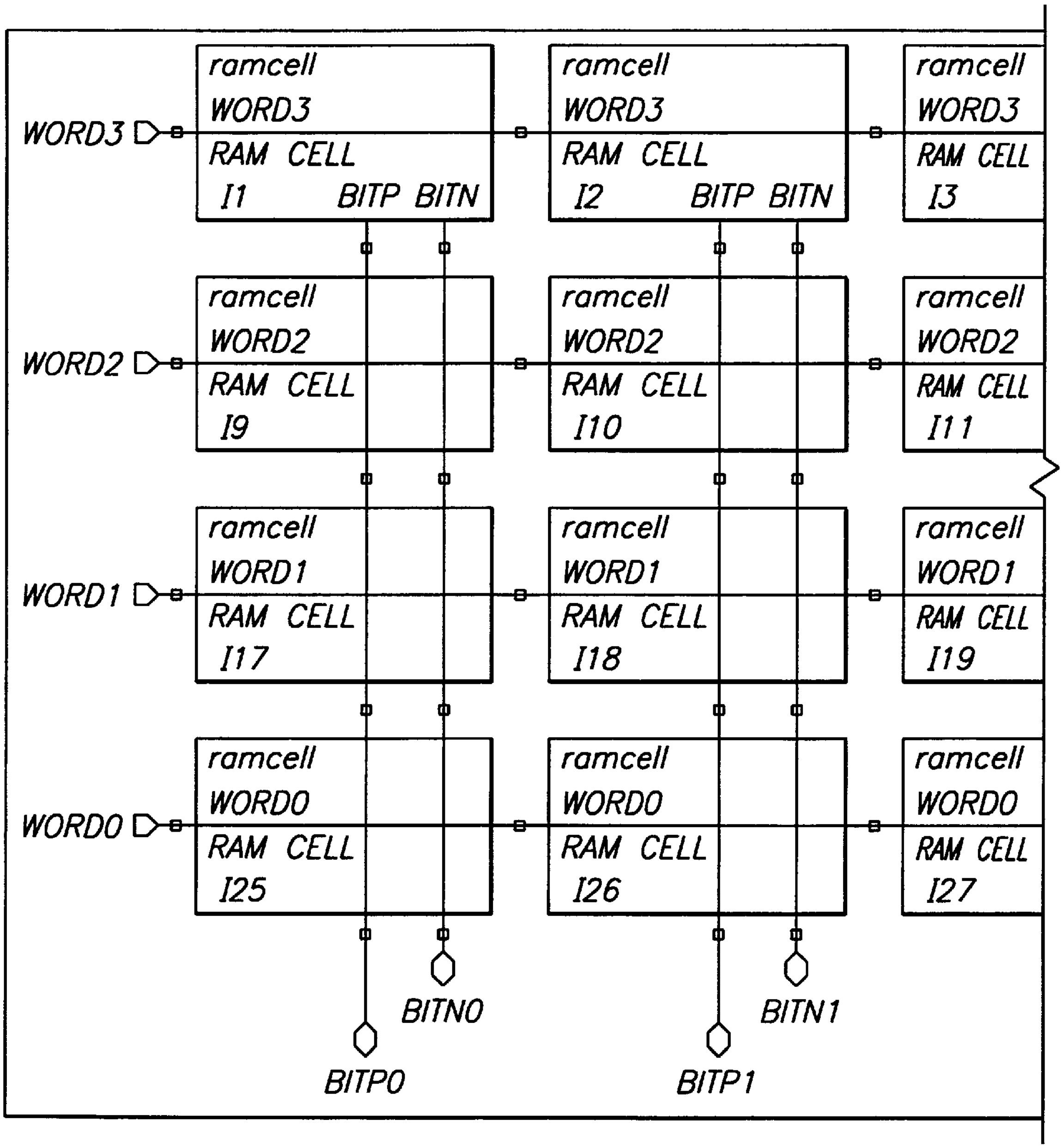
Fig 1.0302AA

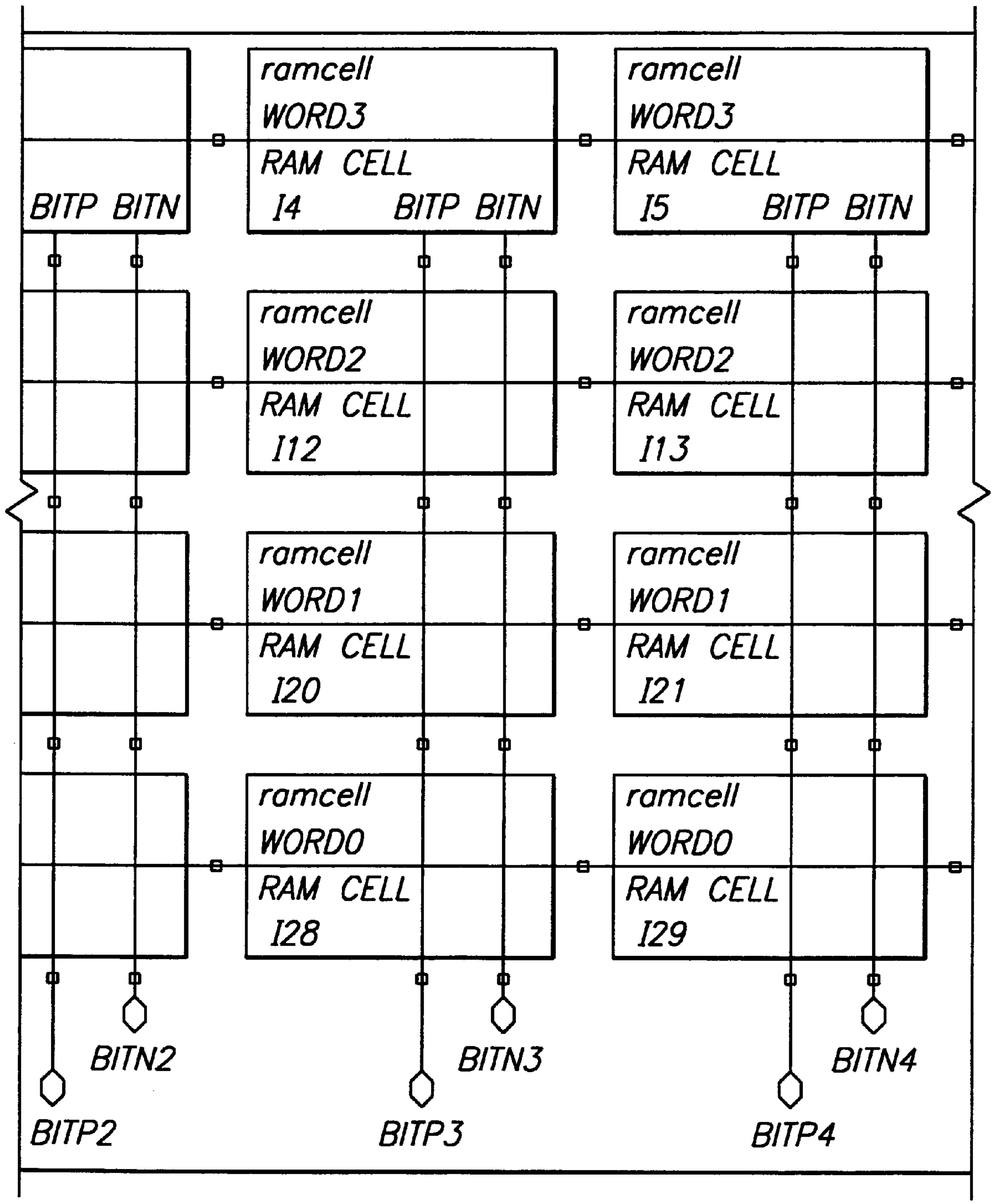
Fig 1.0302AB

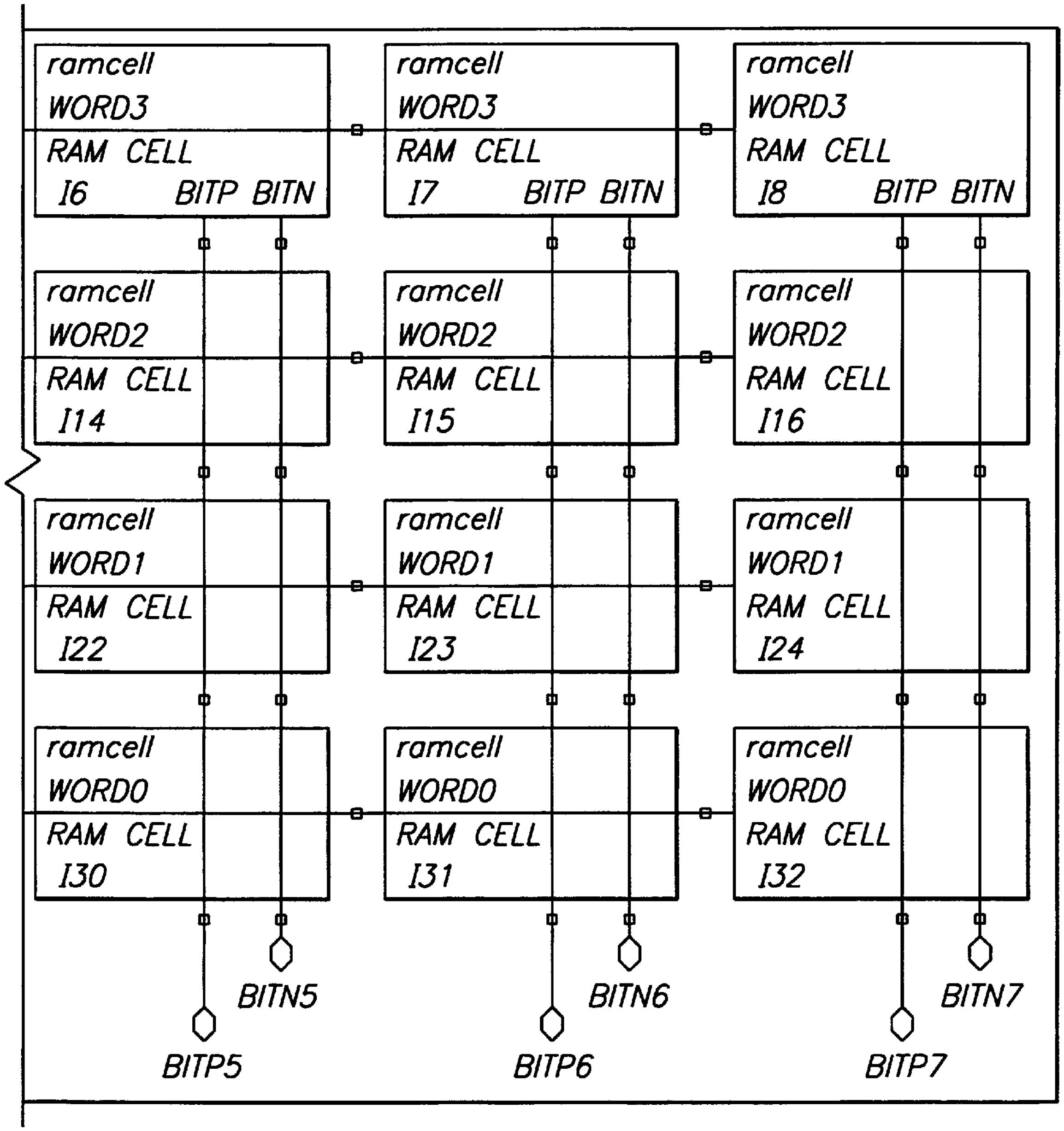
Fig. 1.0302AC

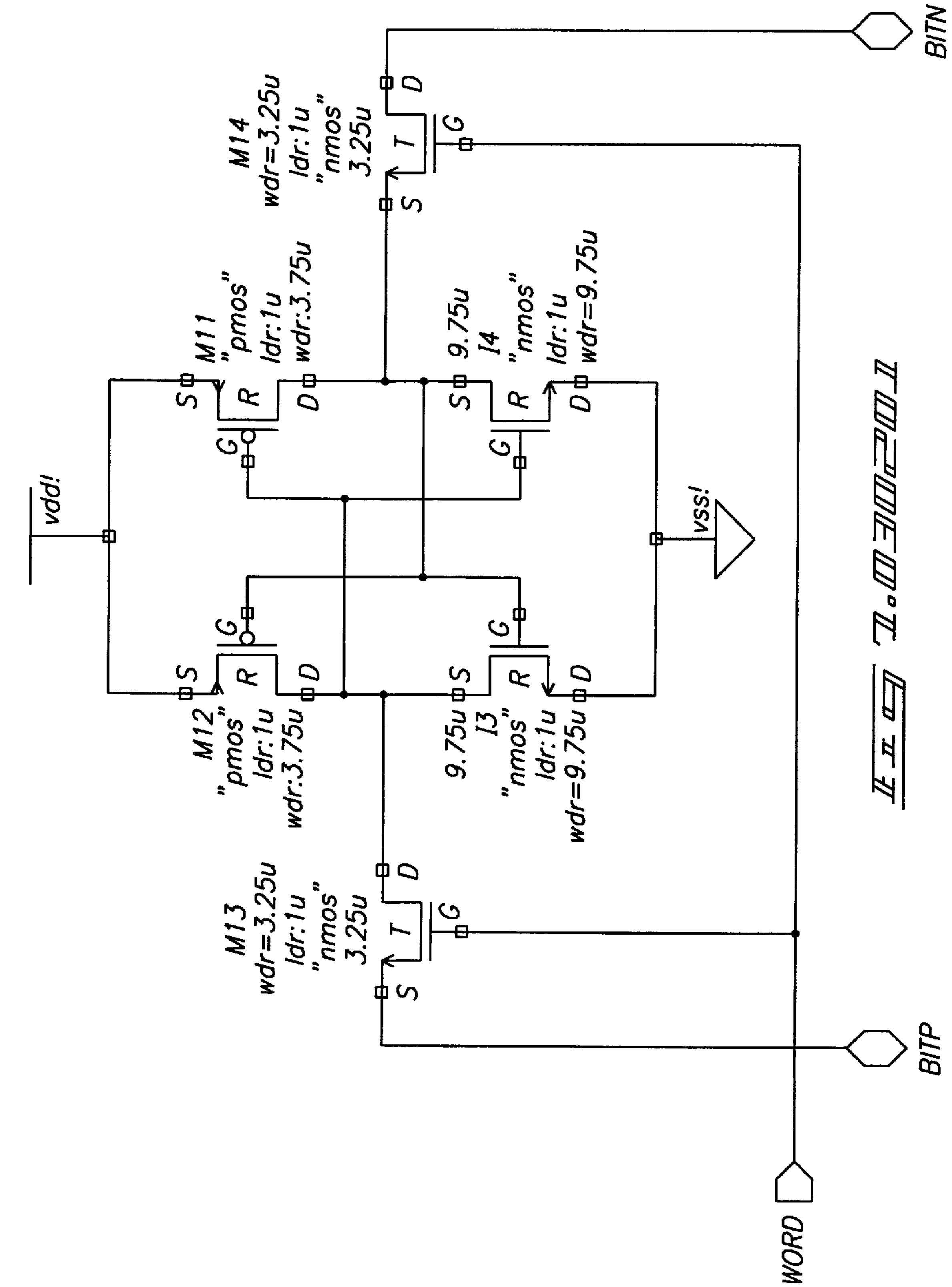
FIG. 7.0E020I

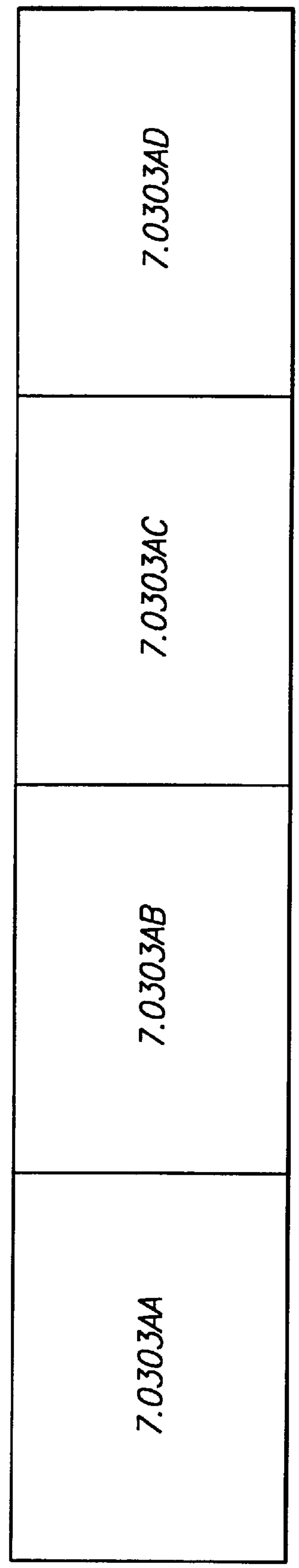
FIG. 7.0303A

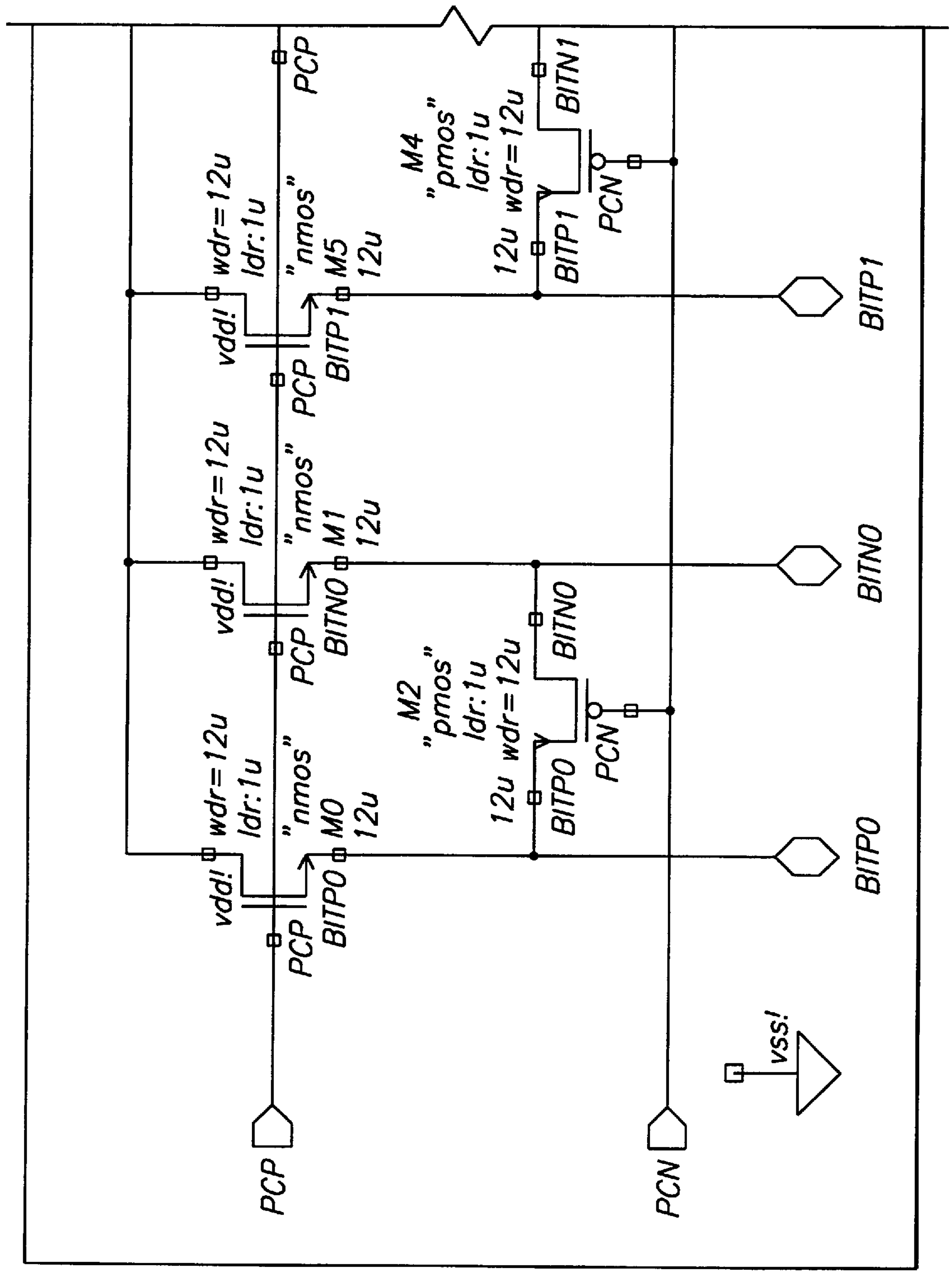
PCP
vdd!
wdr=12u
ldr:1u
"nmos"
M5
12u
BITP1
M1
BITN0
M0
BITP0
M4
"pmos"
wdr=12u
BITN1
PCN
M2
BITP1
BITN0
BITP0
vss!
PCN

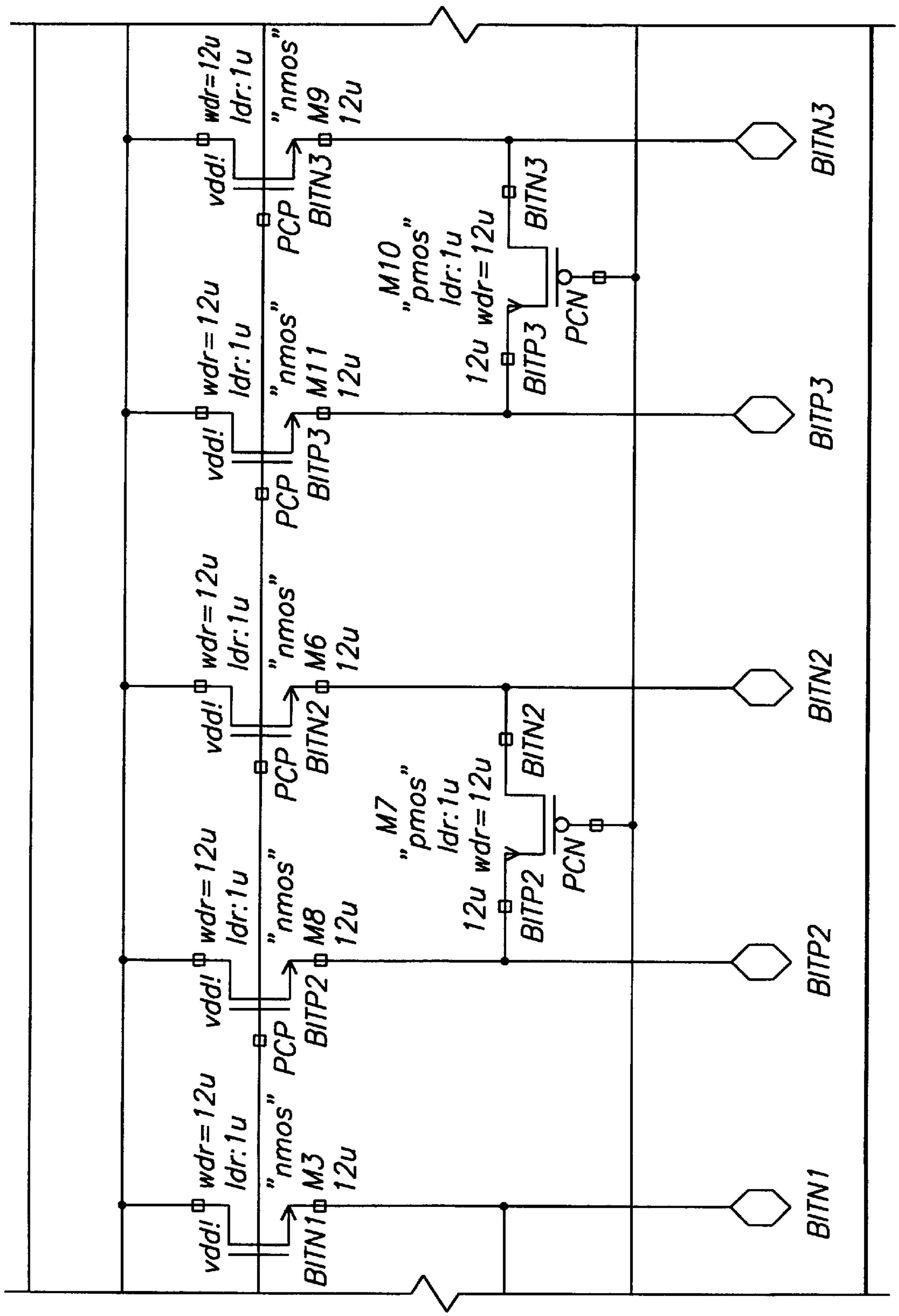
Fig. 7.D3D3AB

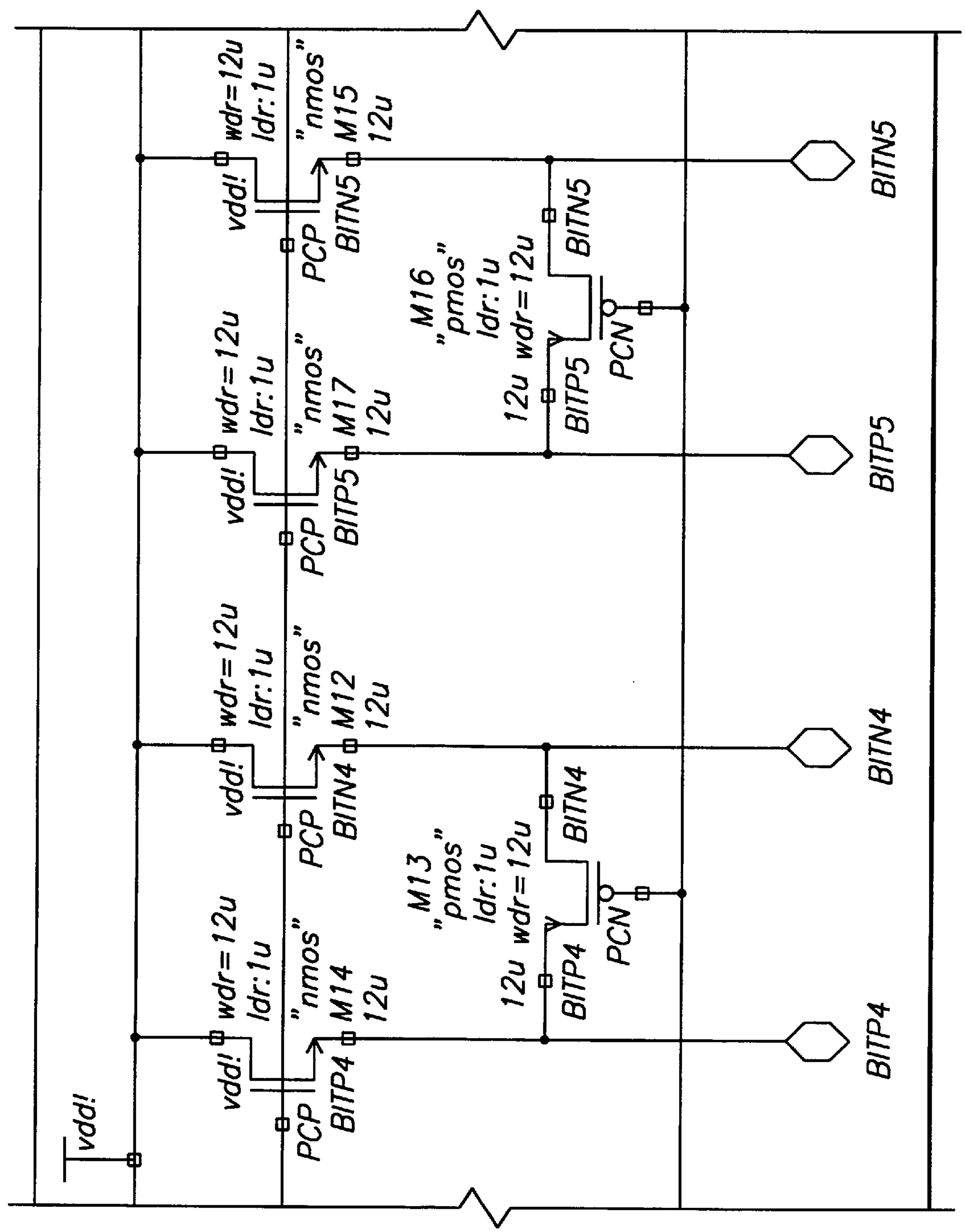
FIG. 7.3E3E3AE

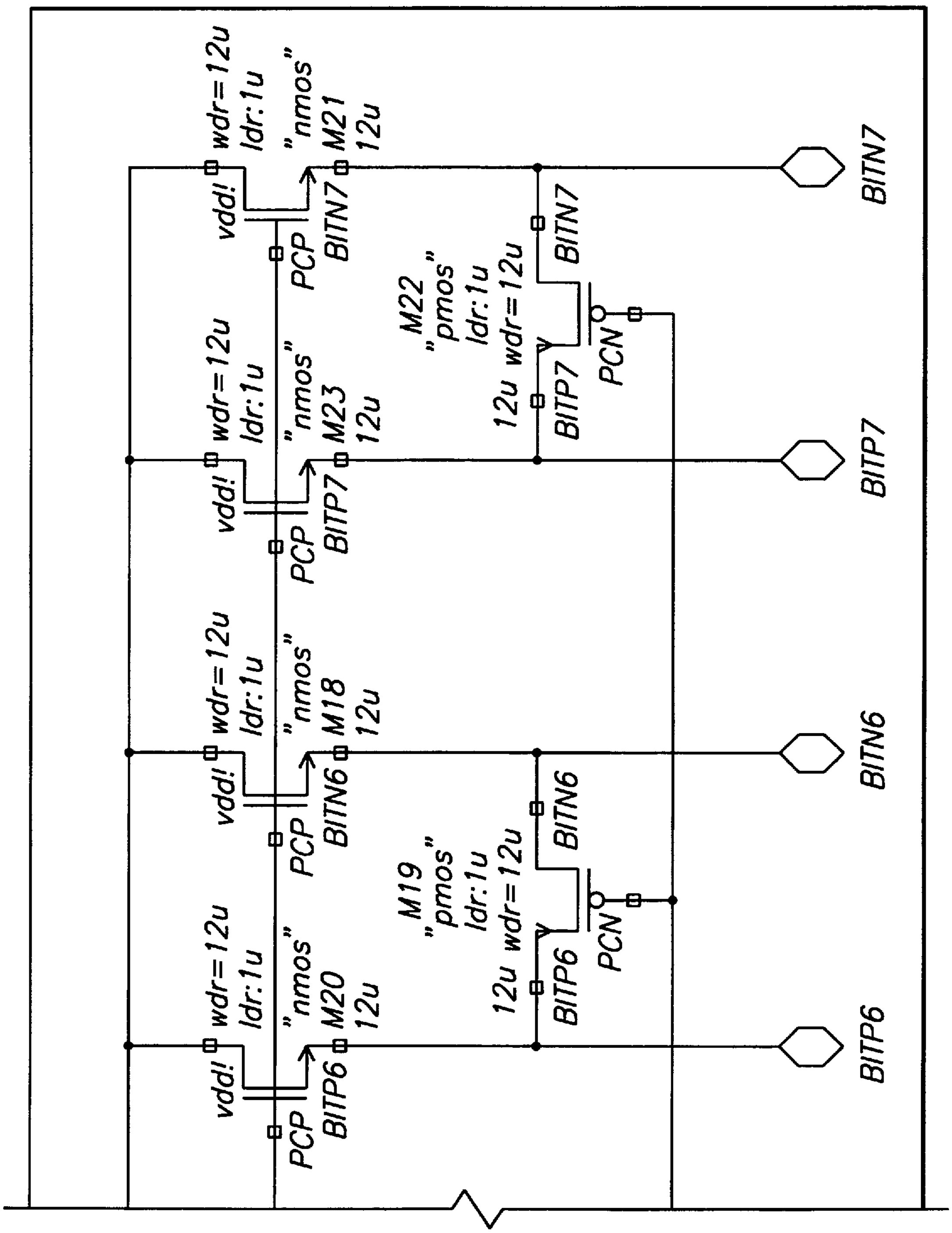
Fig. 7.0303AD

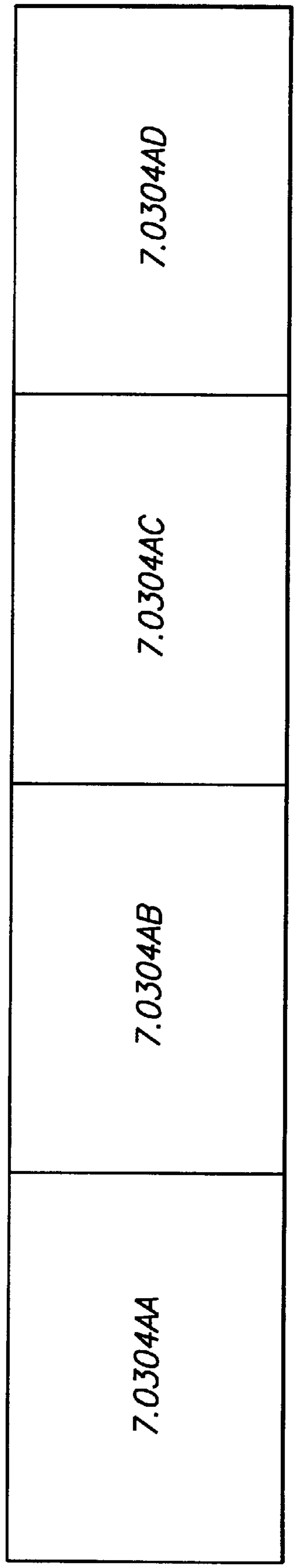
FIG. 7.0304A

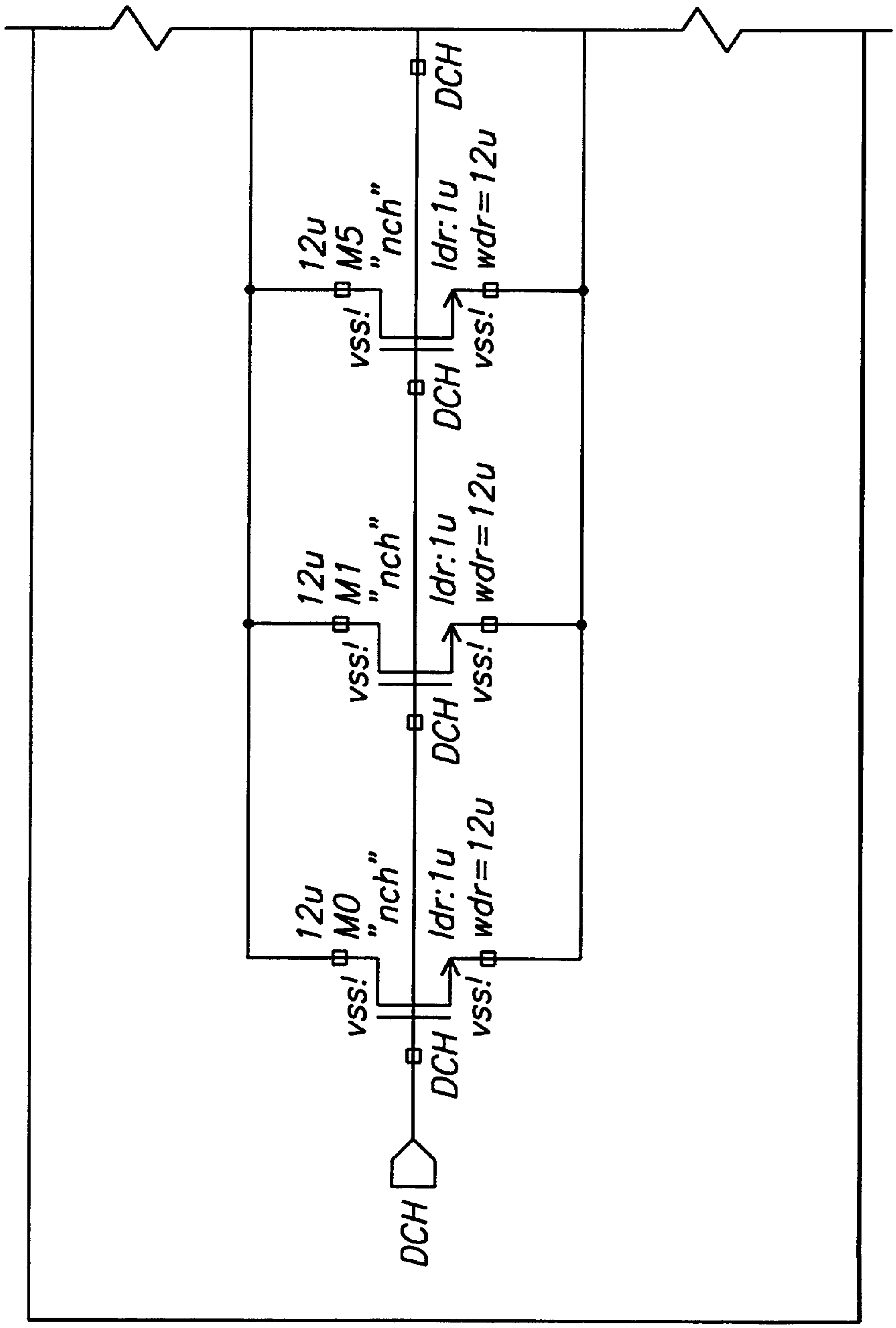
FIG. 7.0304AA

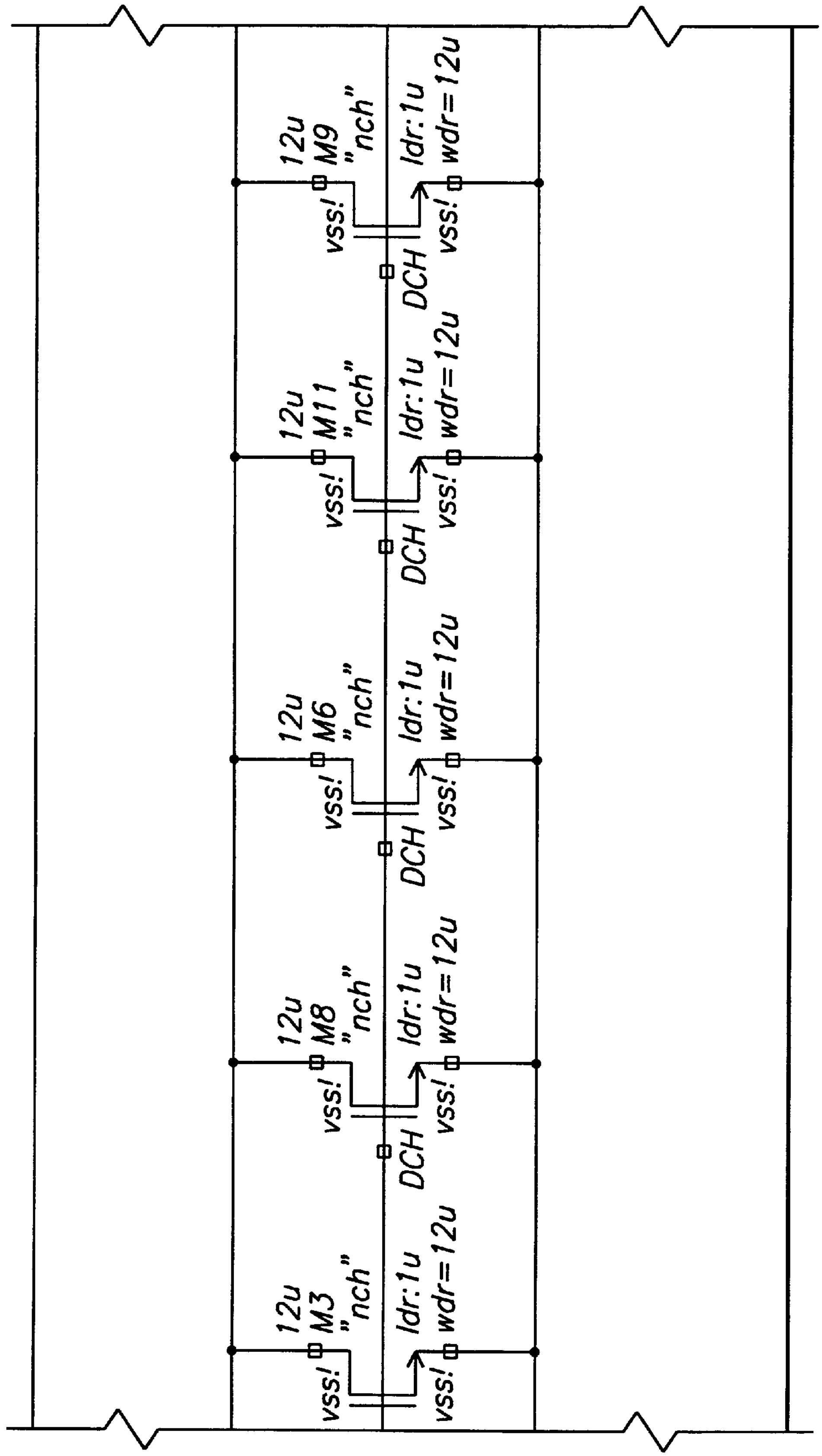
Fig. 7.0DE48

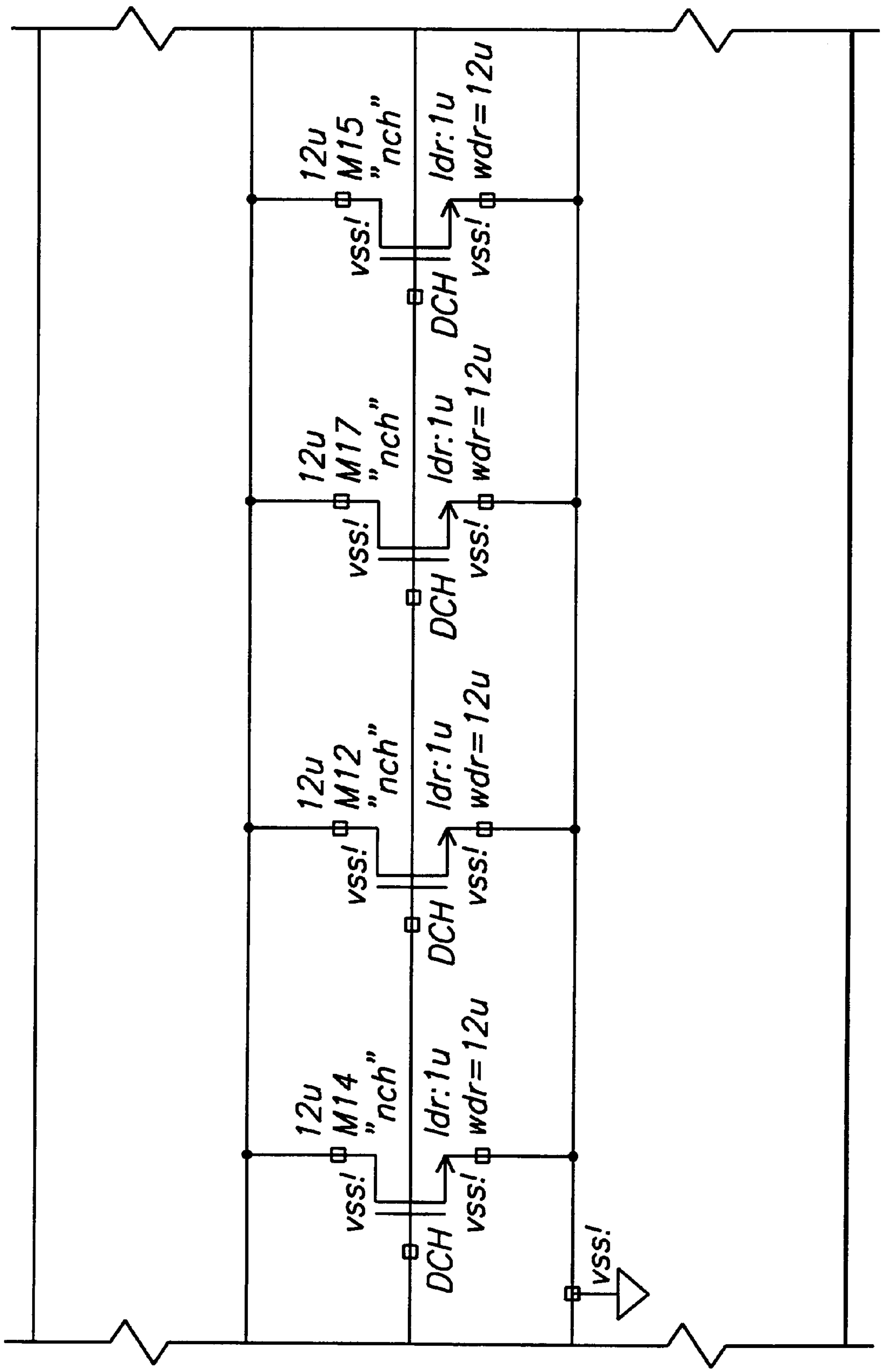
FIG. 7.0304AC

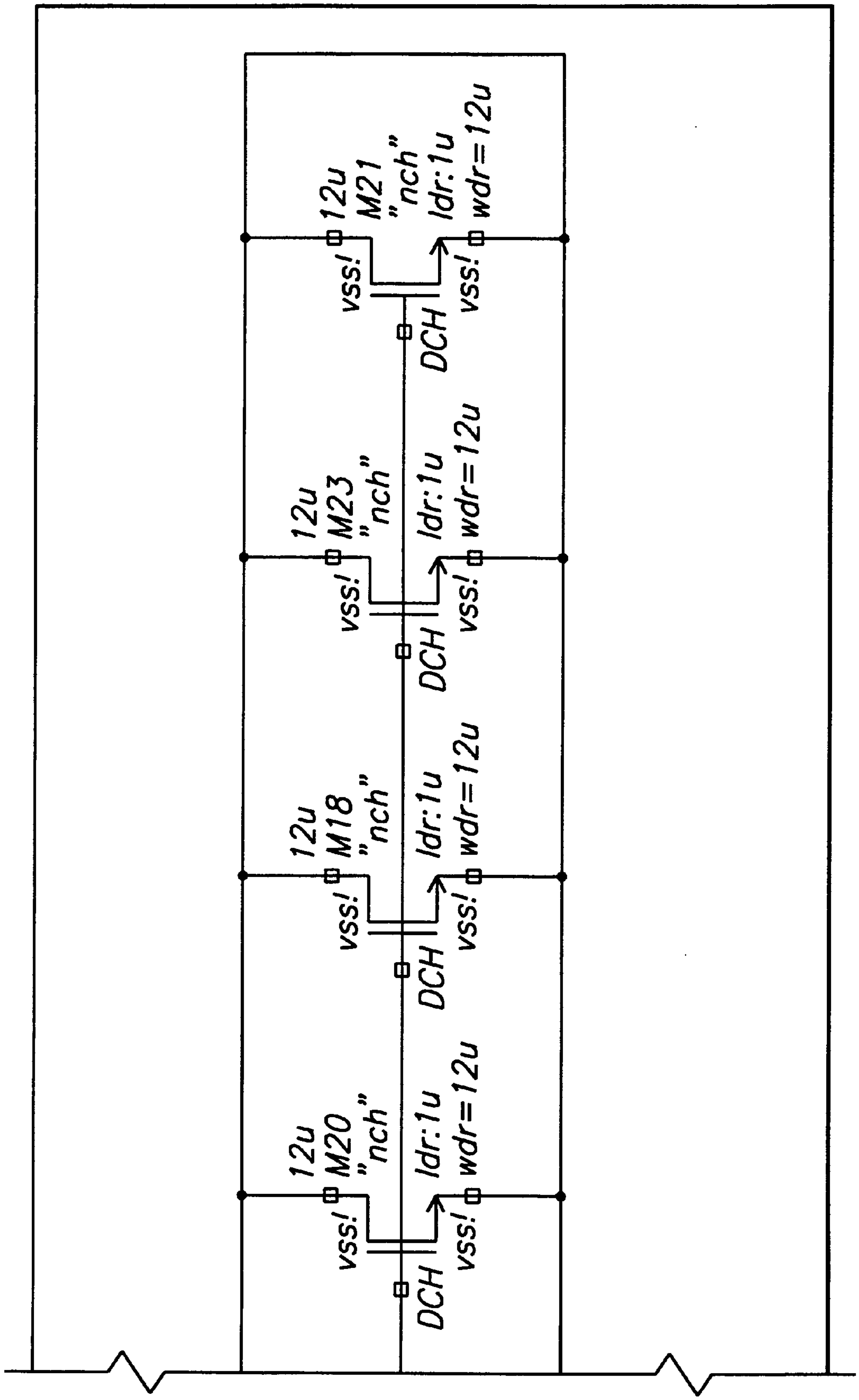
FIG. 1.0304UD

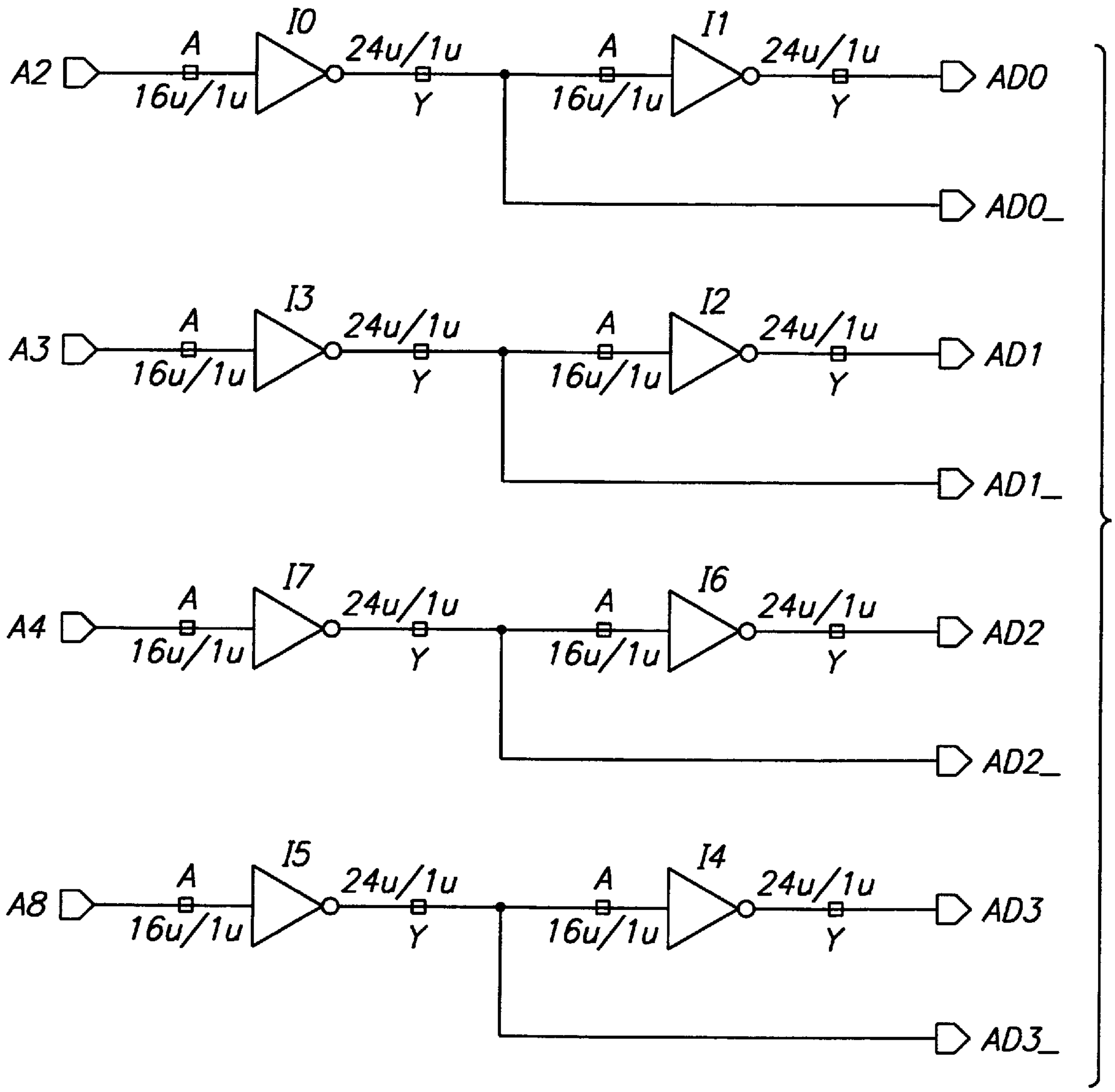
Fig 1.0305

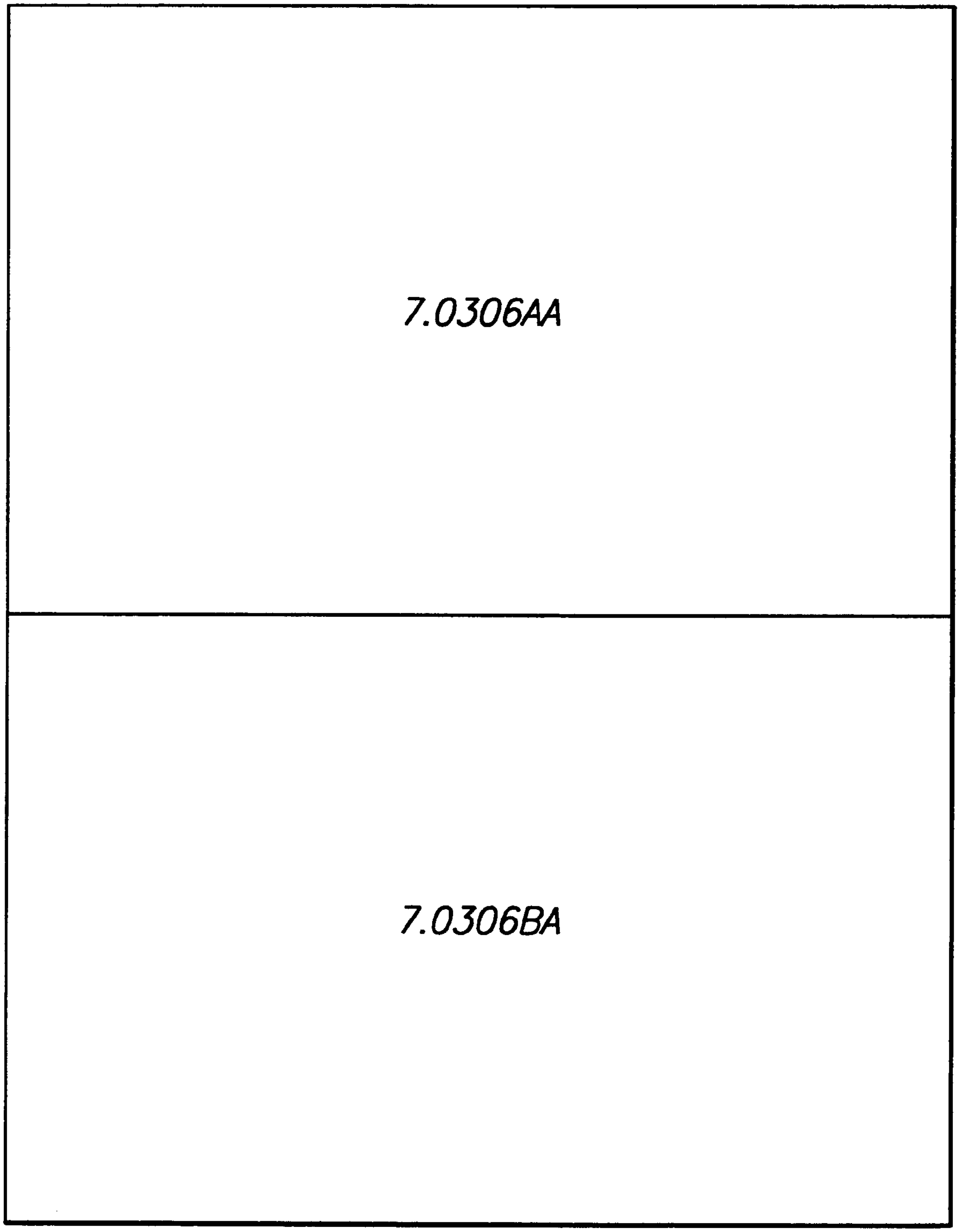
Fig 7.0306

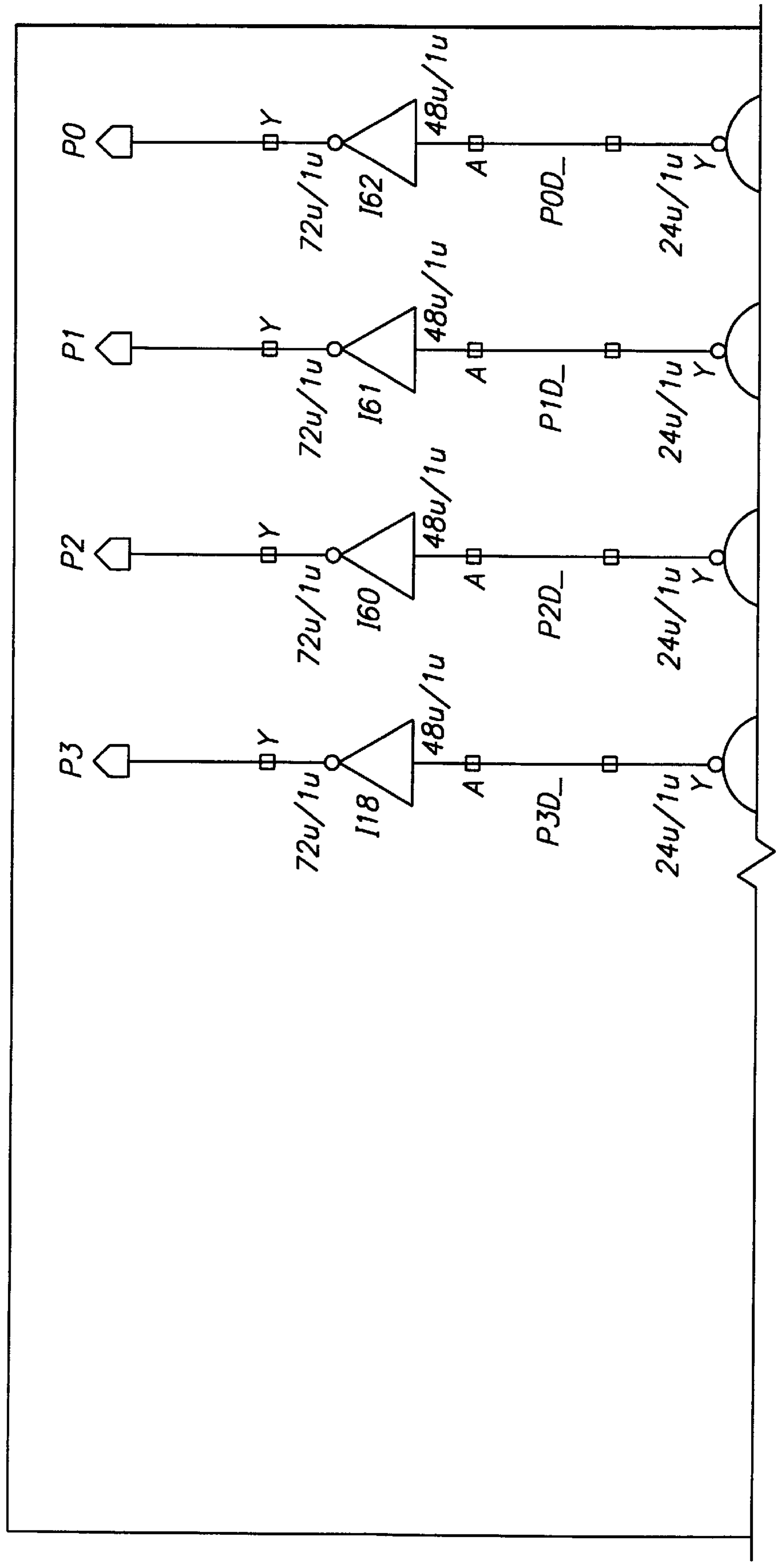
FIG. 7.0306AA

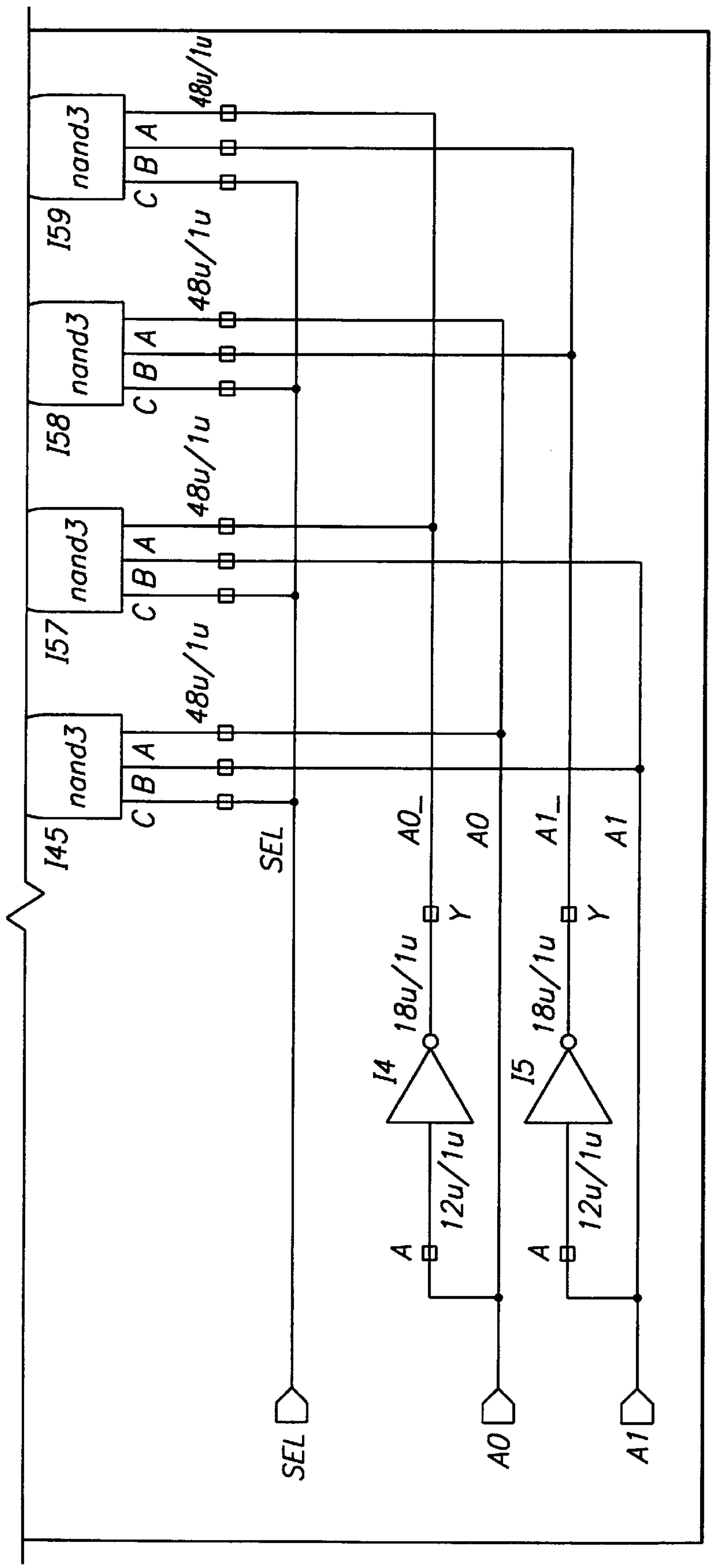
FIG. 7.0306BA

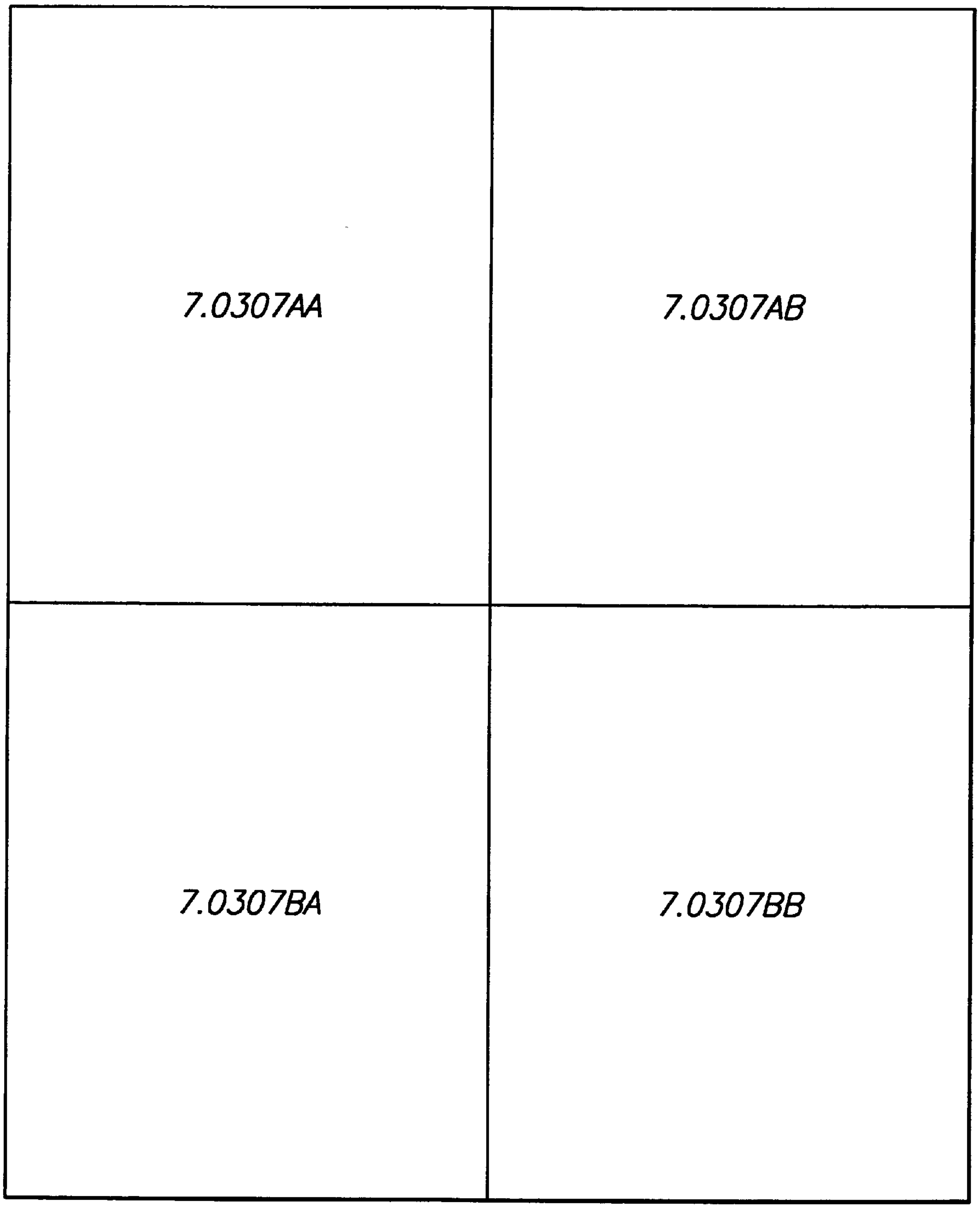
FIG. 7.0307

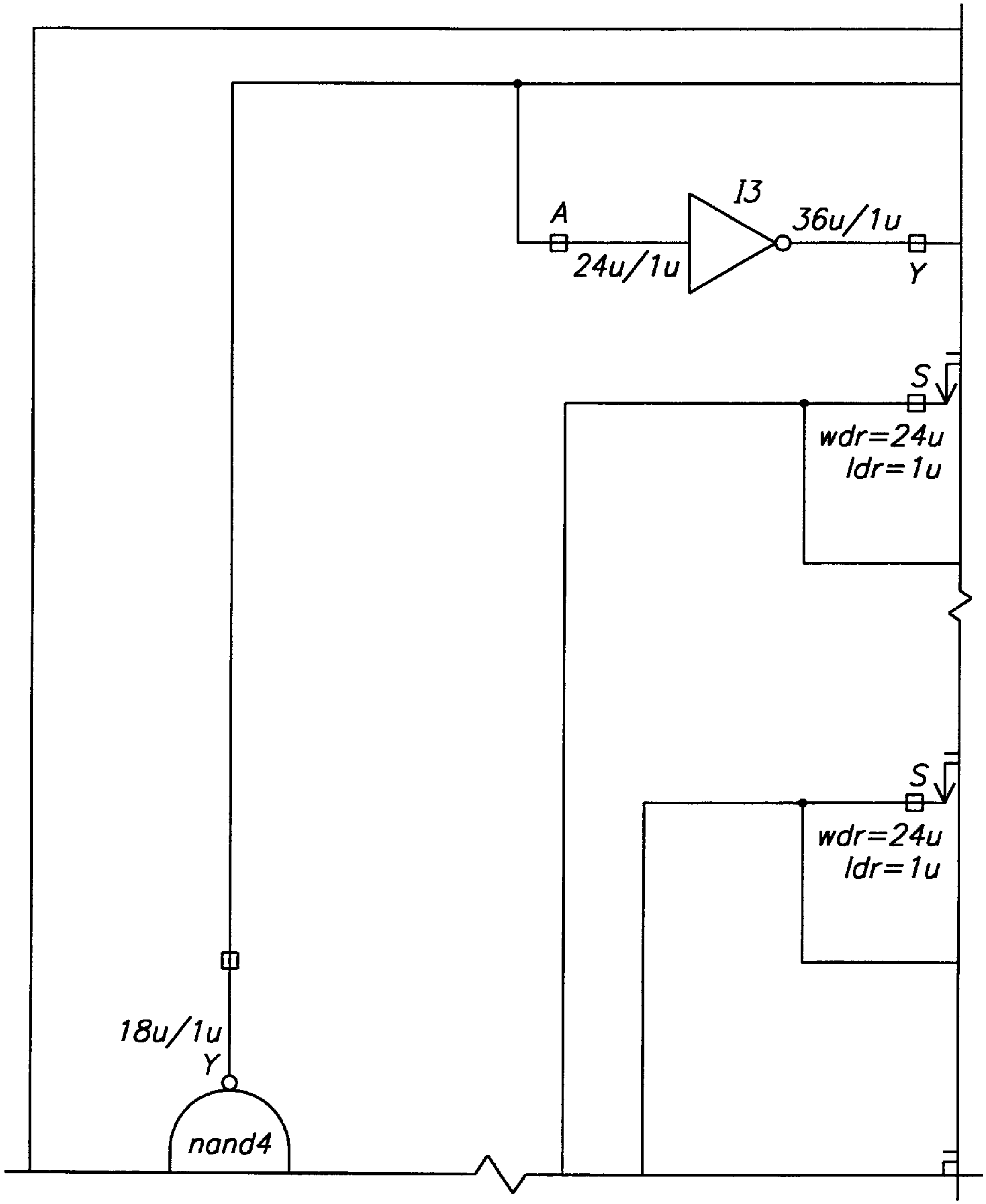
FIG 1.0301AA

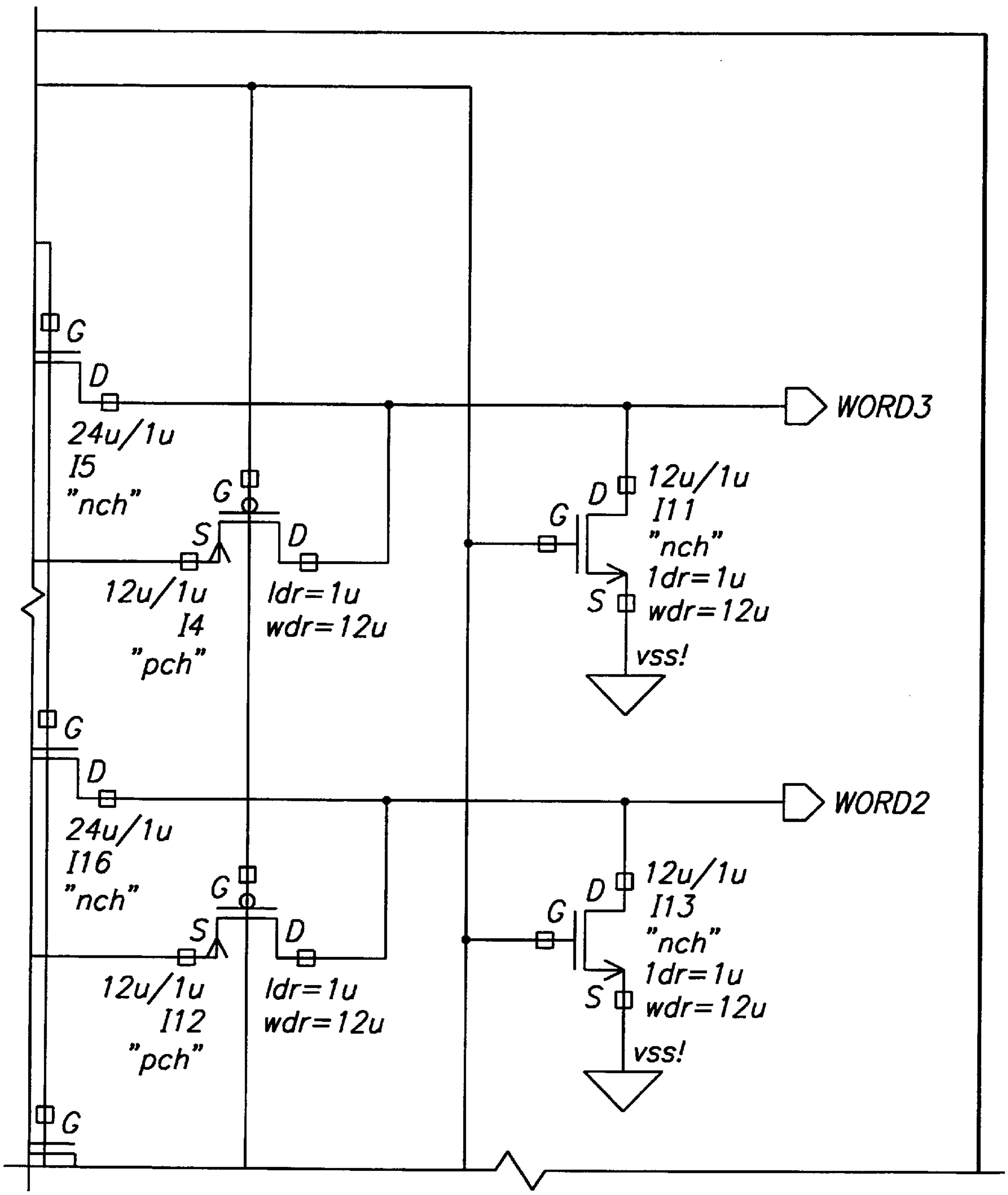
Fig 1.0301AB

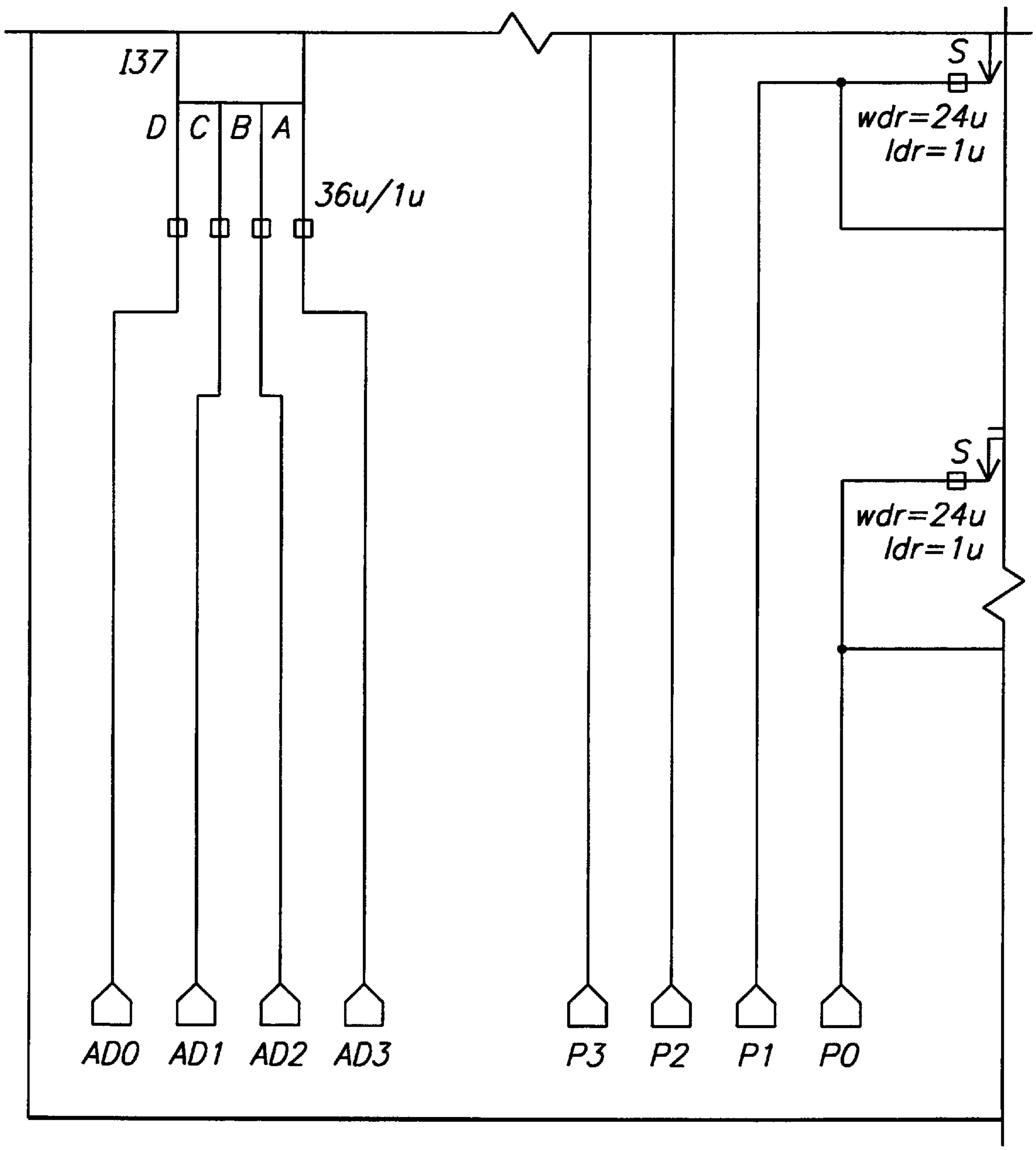
FIG. 1.0301BA

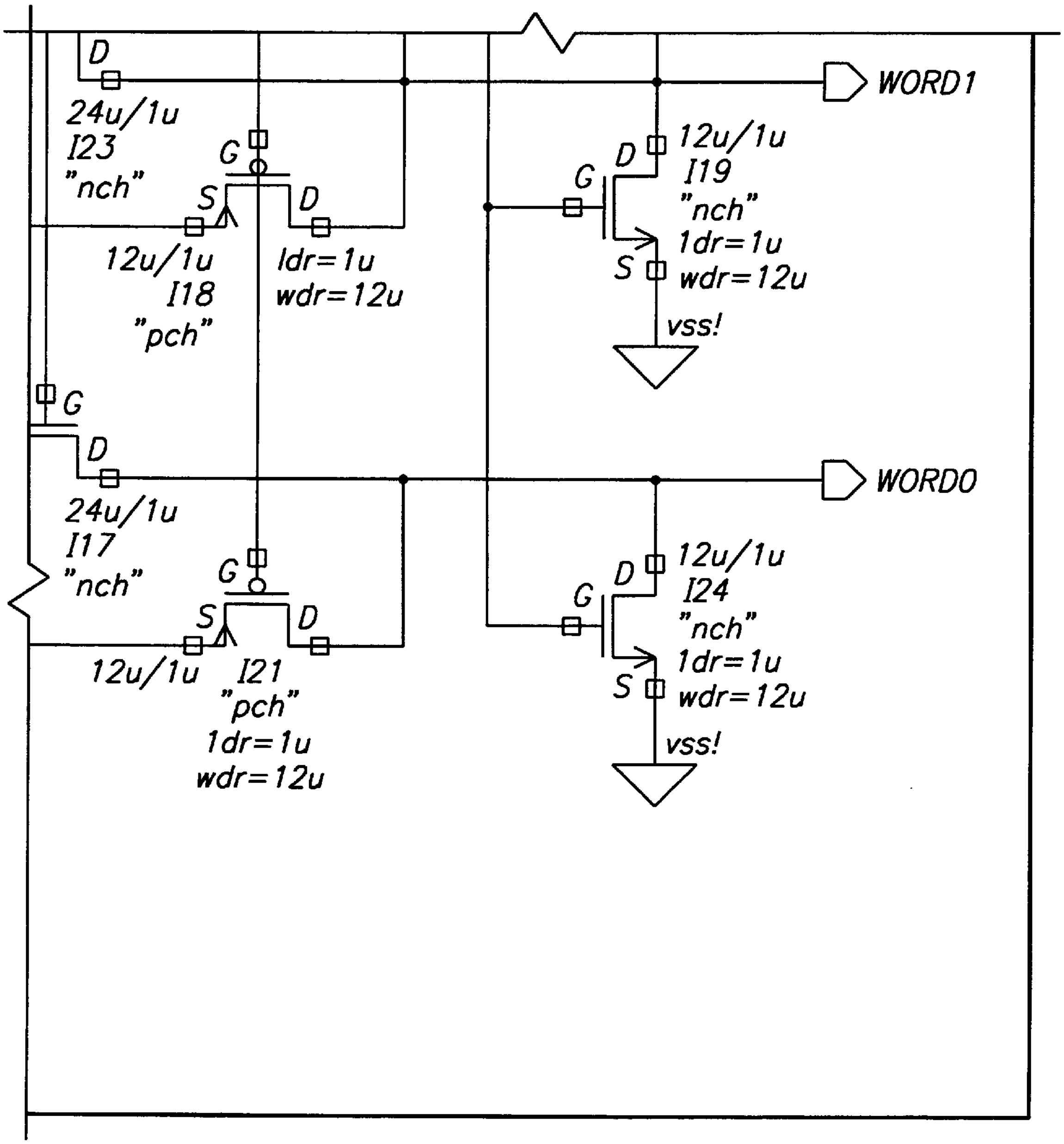
Fig 7.0307BB

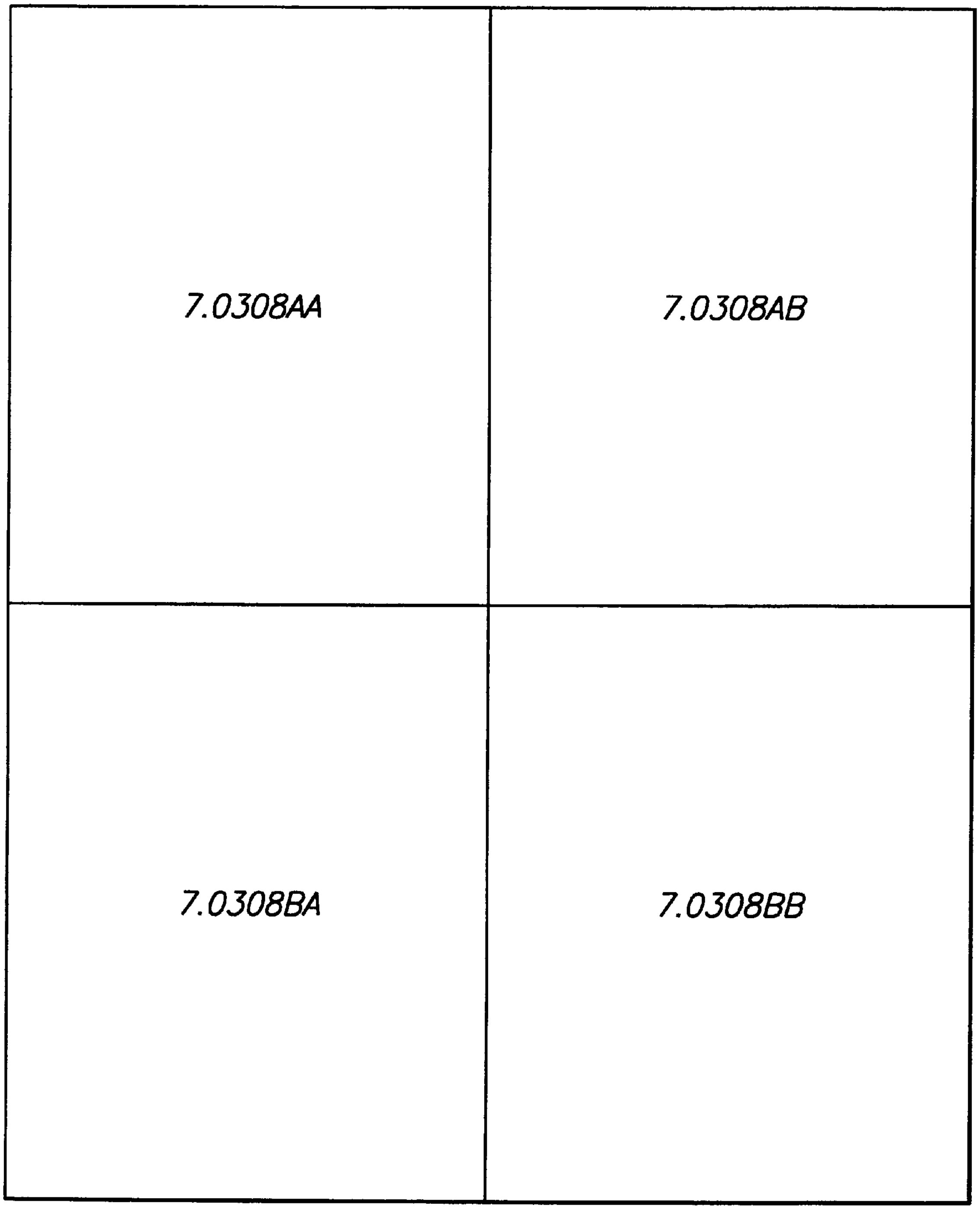
Fig 7.0308

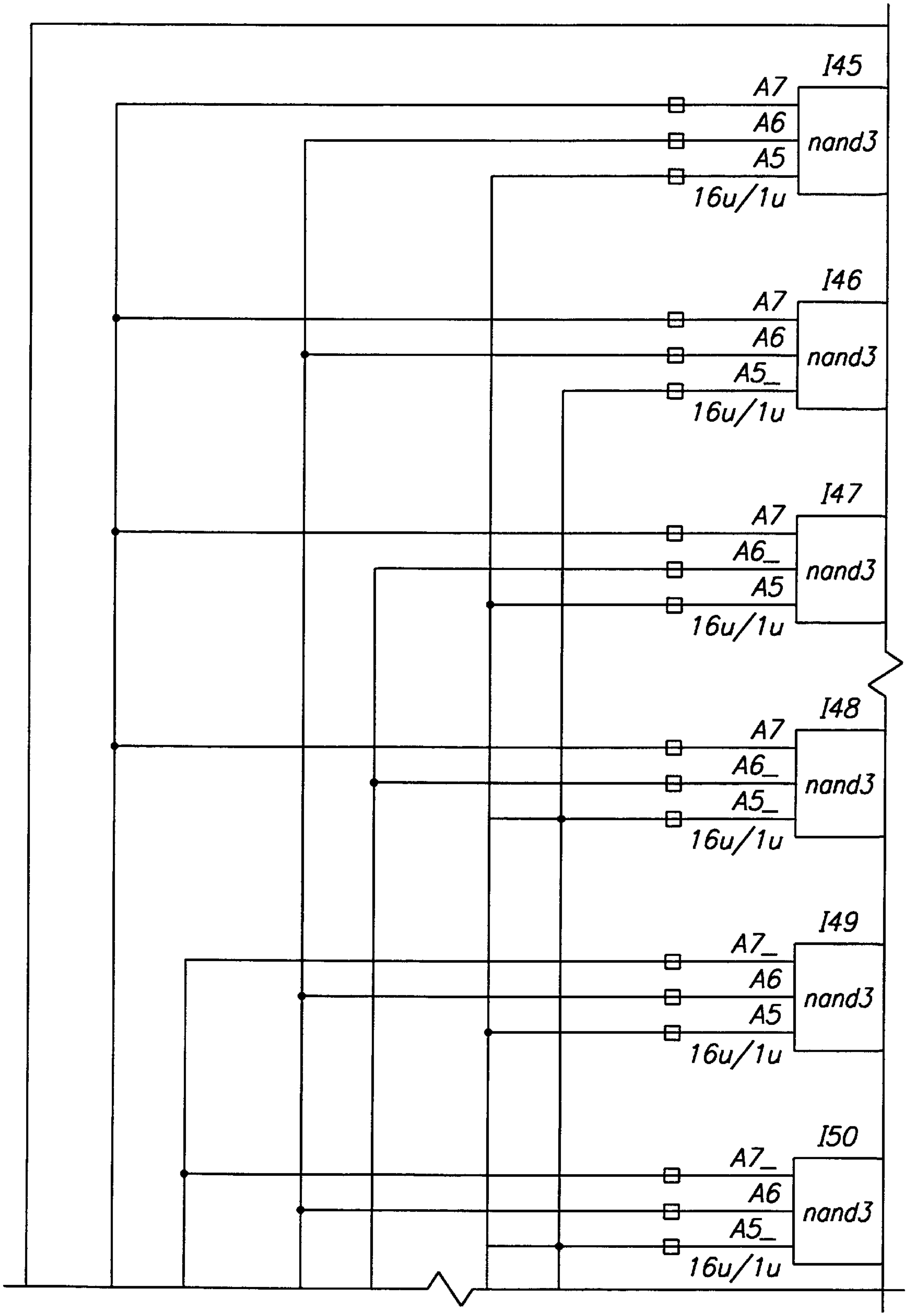
Fig. 1.030BAA

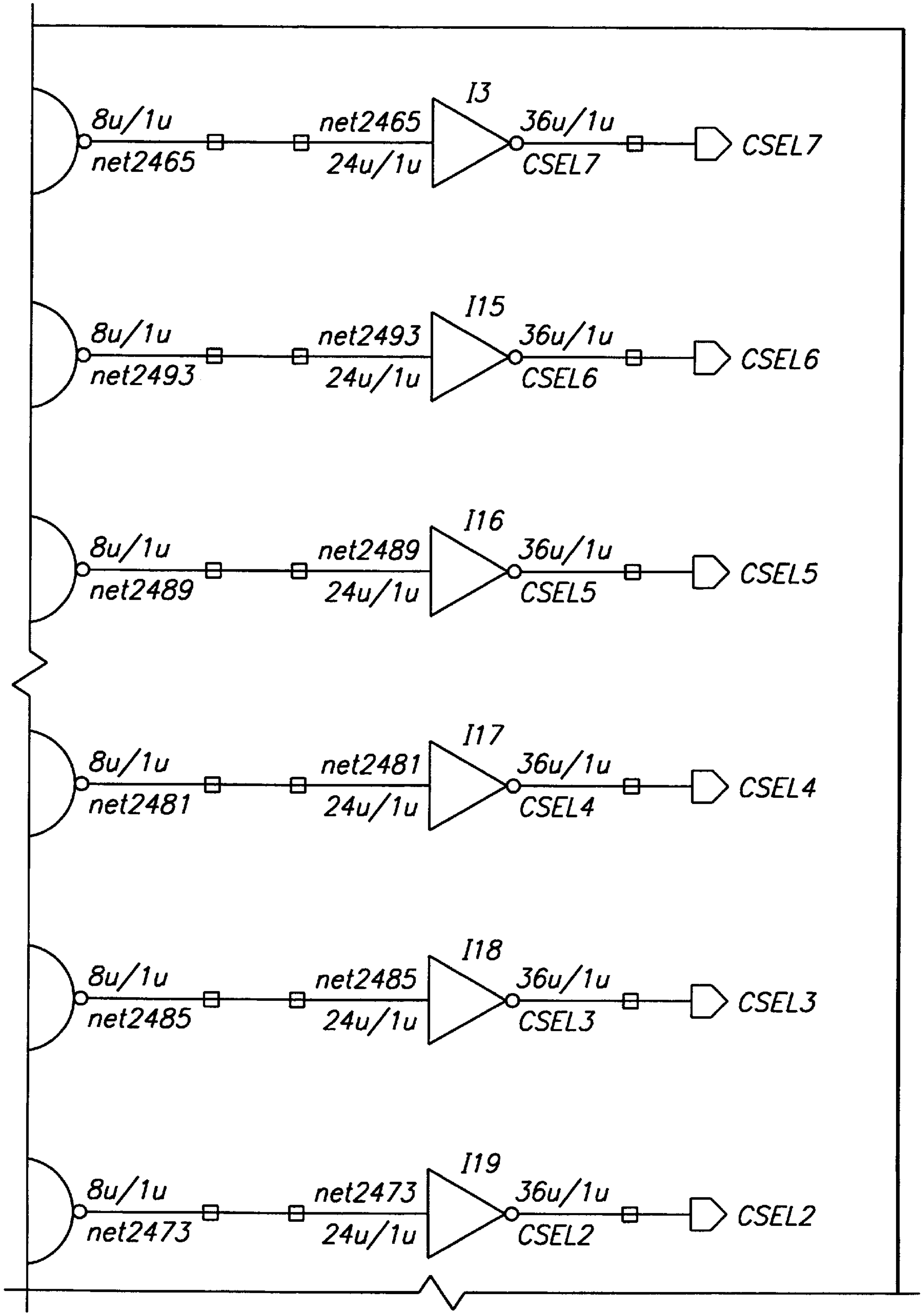
Fig 1.0308AB

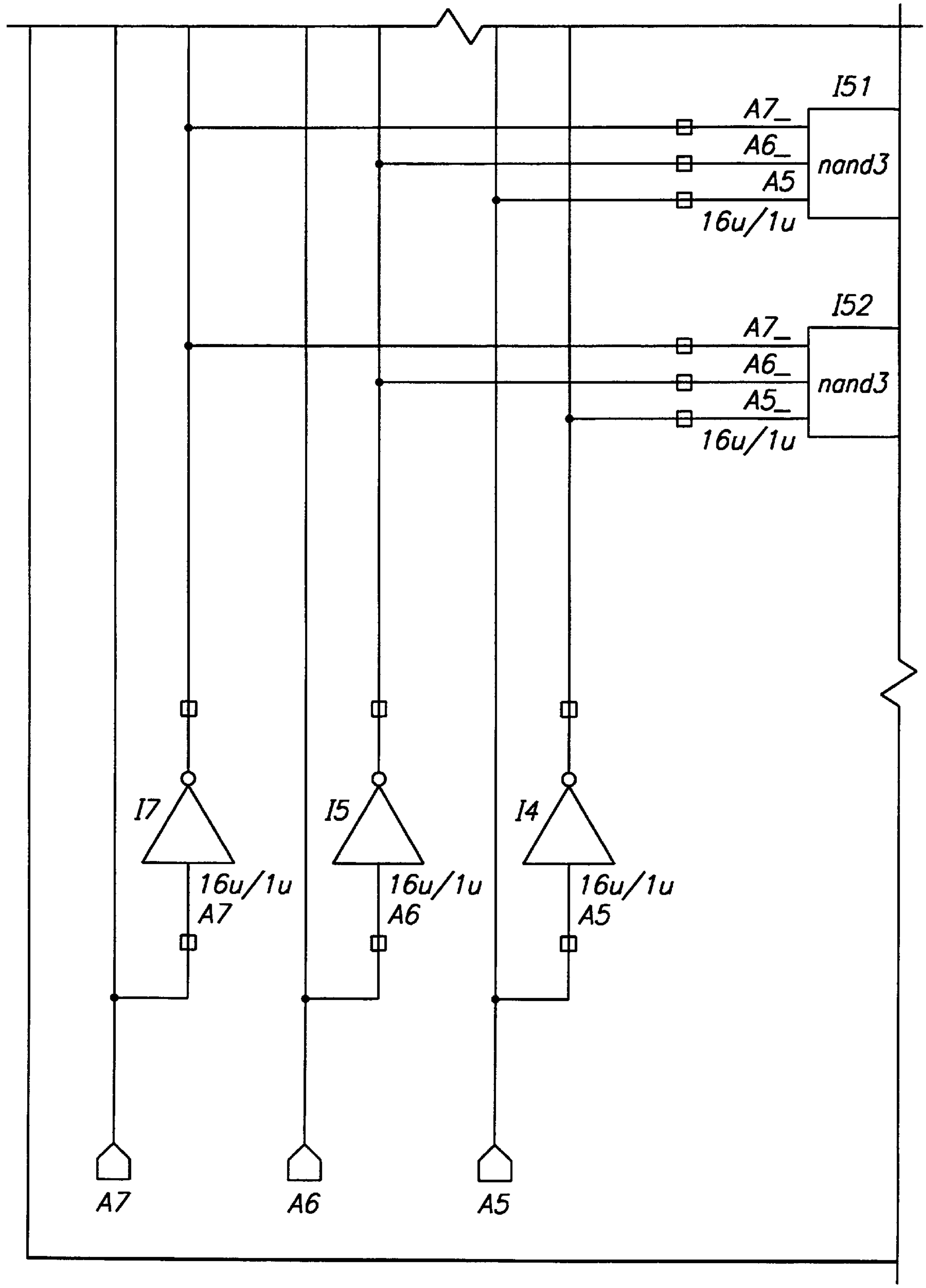
Fig 7.0308BA

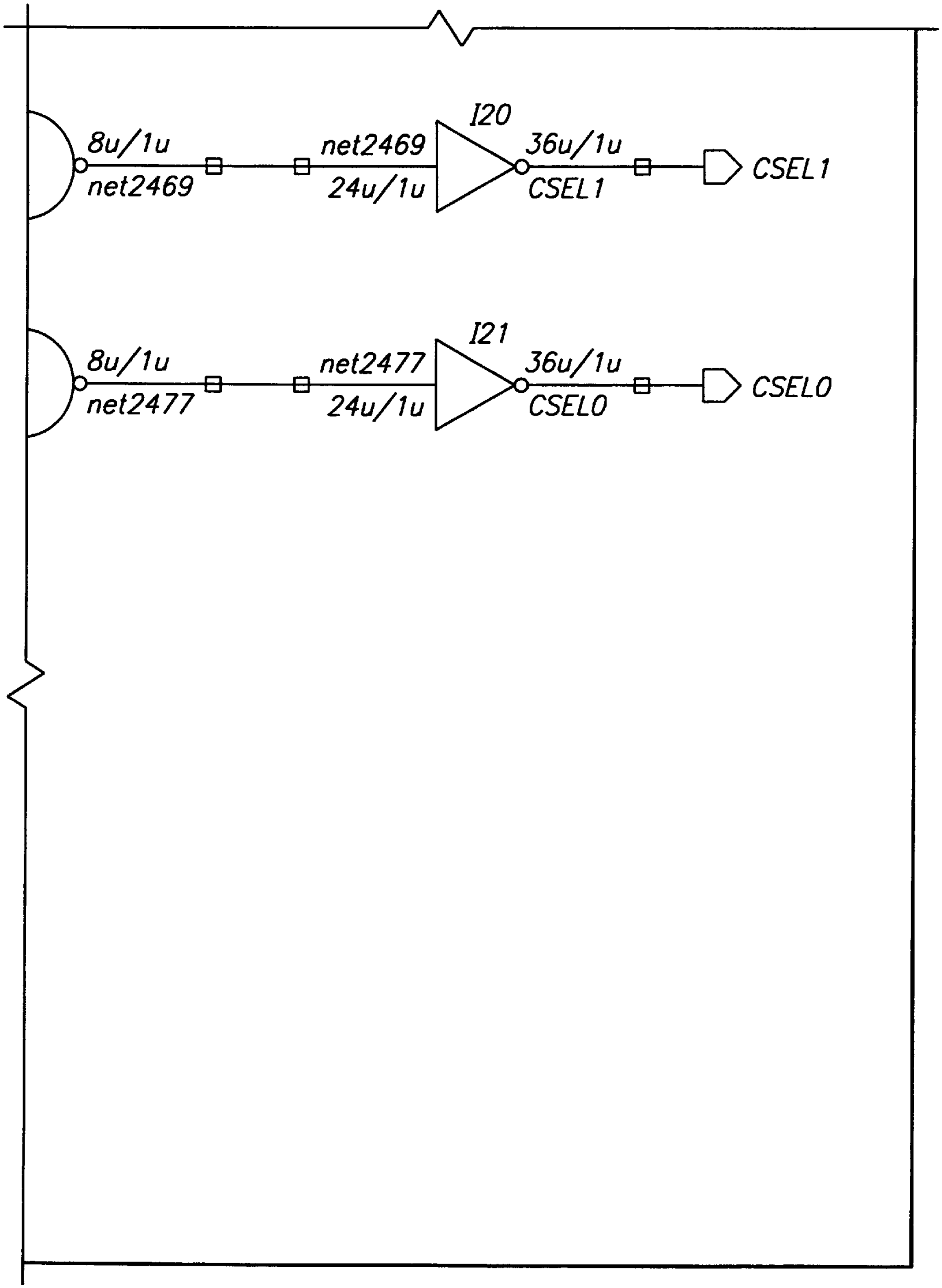
Fig. 1.0308BB

| | | | | | | |
|---|---|---|---|---|---|---|
| 7.0309AA | 7.0309AB | 7.0309AC | 7.0309AD | 7.0309AE | 7.0309AF | 7.0309AG |
| 7.0309BA | 7.0309BB | 7.0309BC | 7.0309BD | 7.0309BE | 7.0309BF | 7.0309BG |

FIG. 7.0309

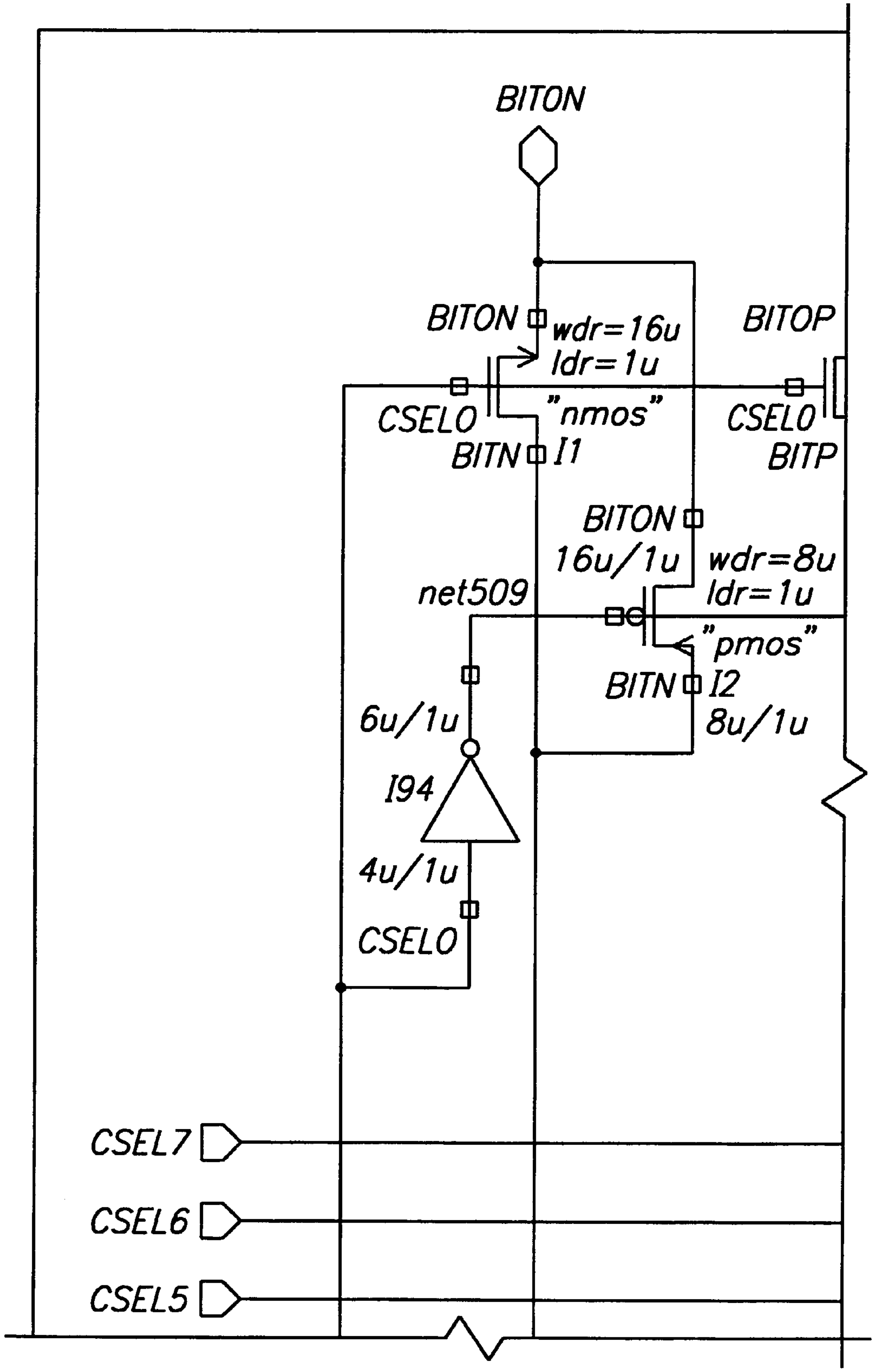
Fig 1.0309AA

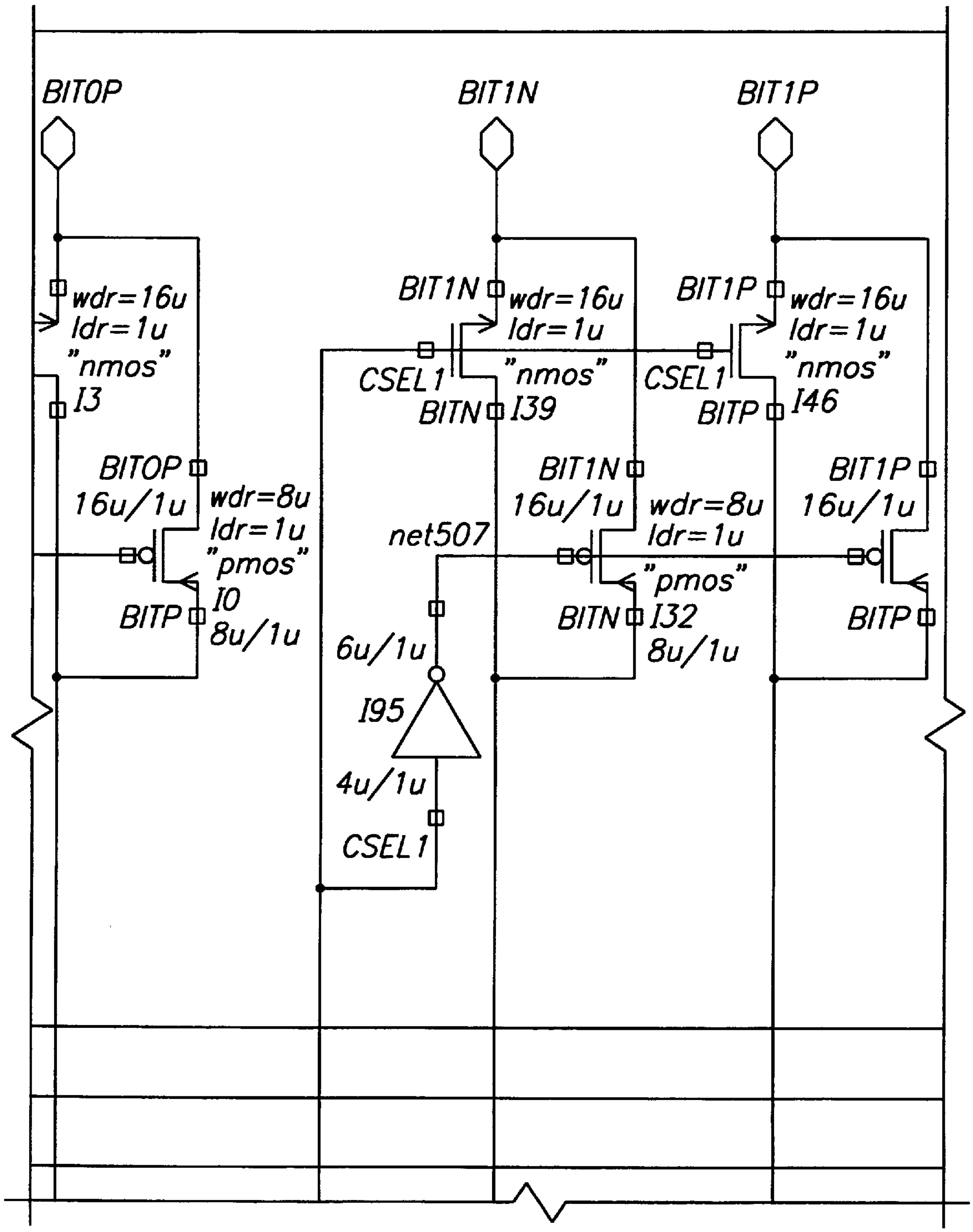
FIG. 1.0309AB

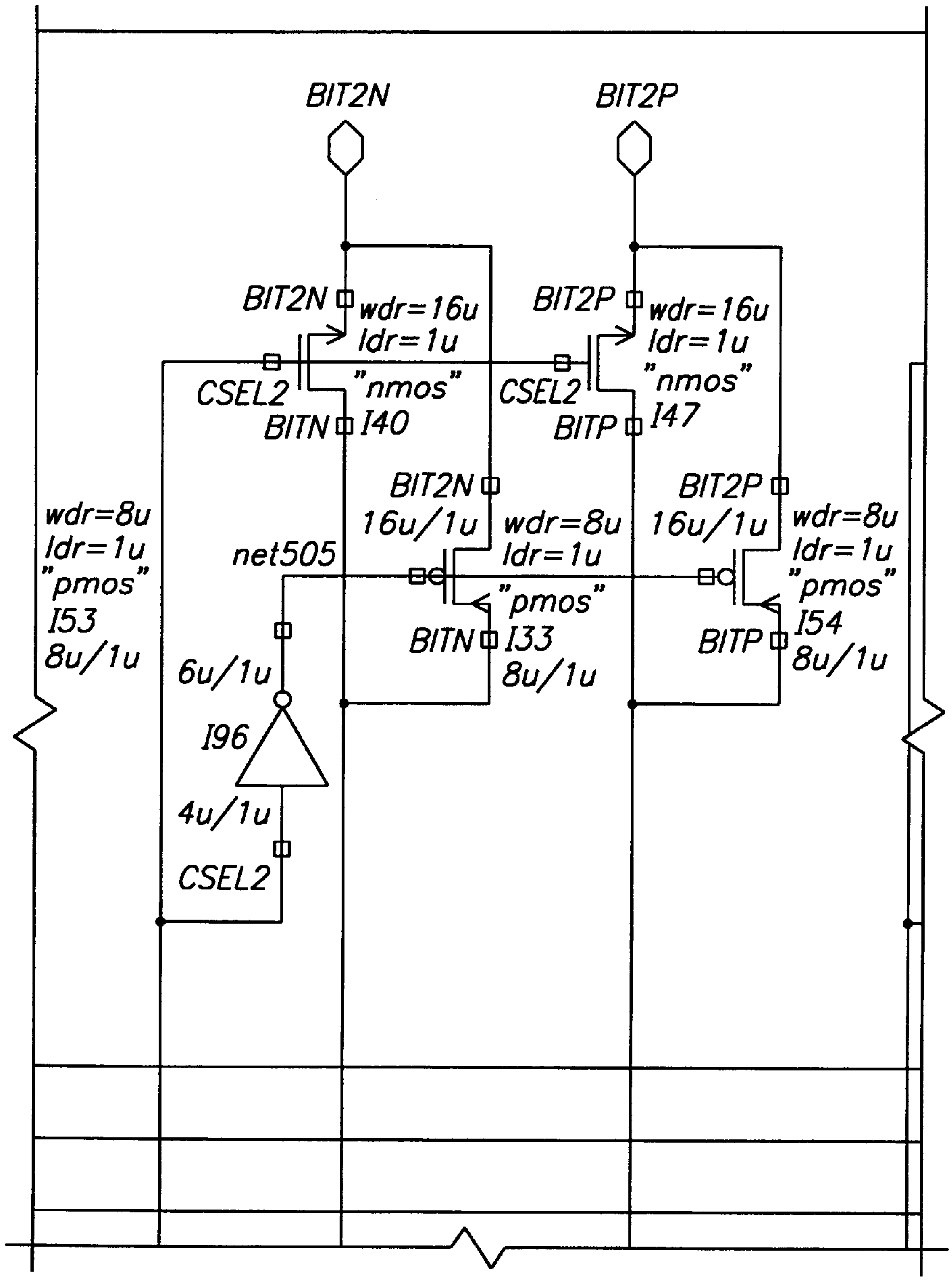
Fig 1.0309AC

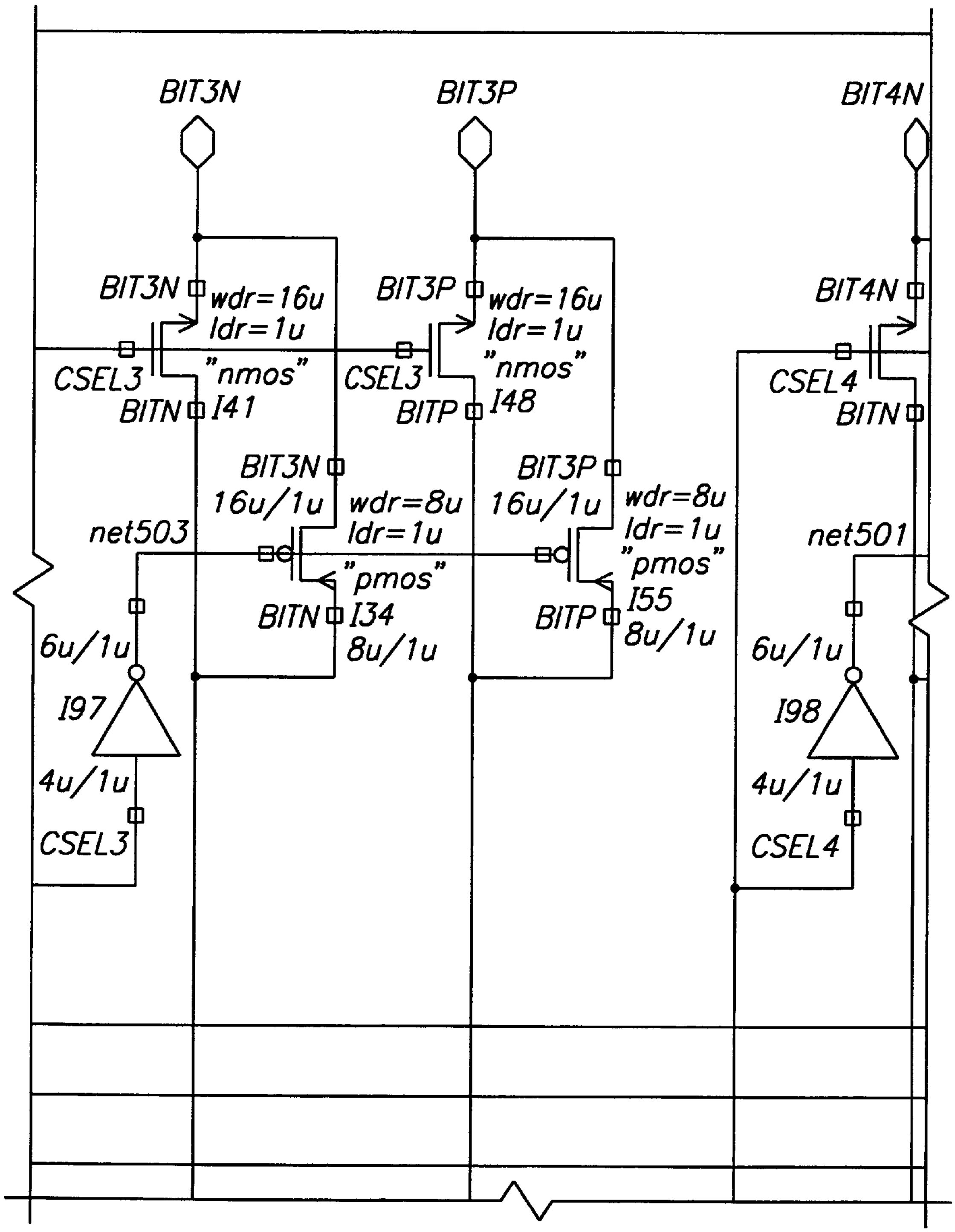
Fig 7.0309AD

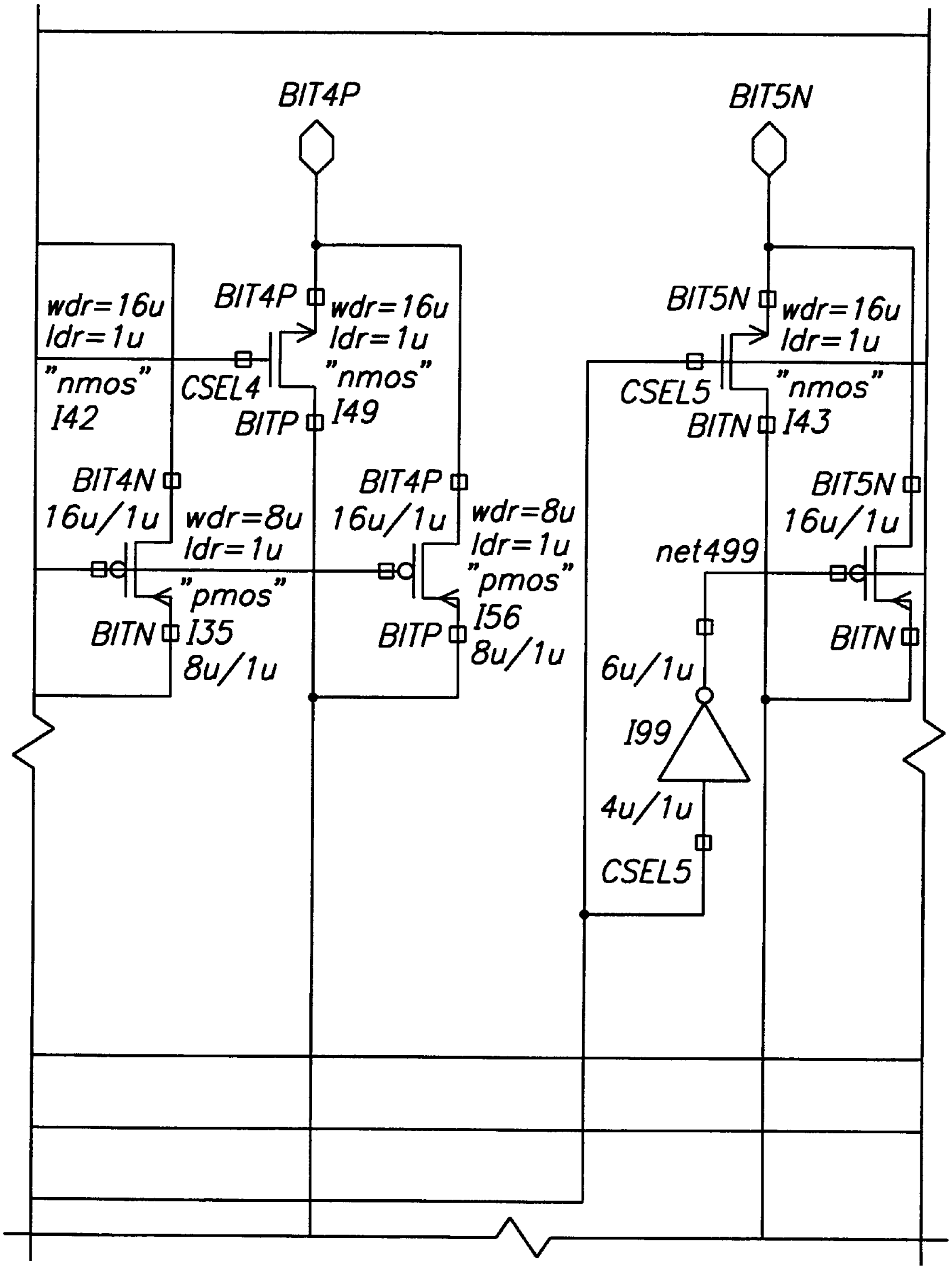
FIG. 1.0309AE

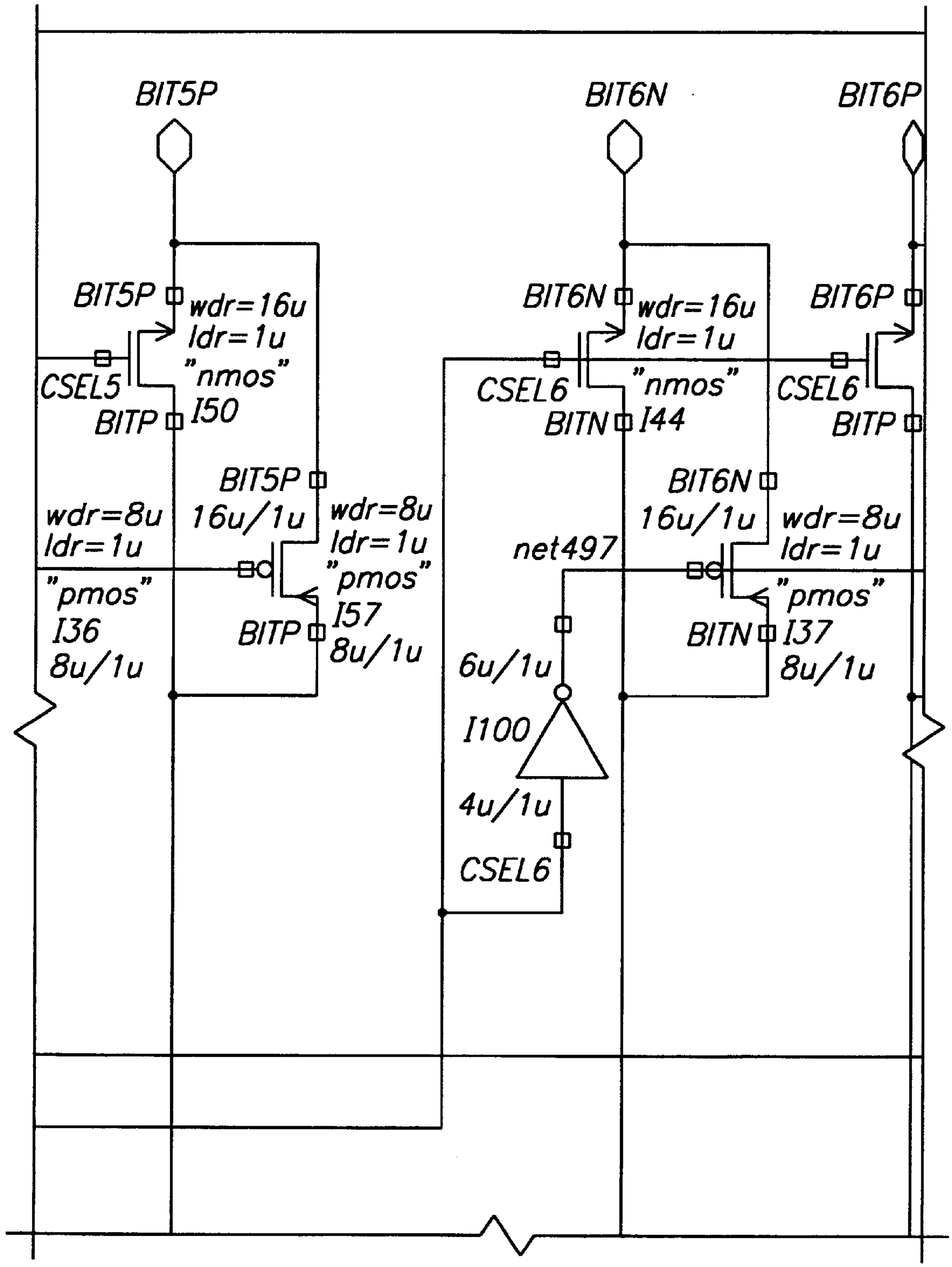
FIG. 1.0309AF

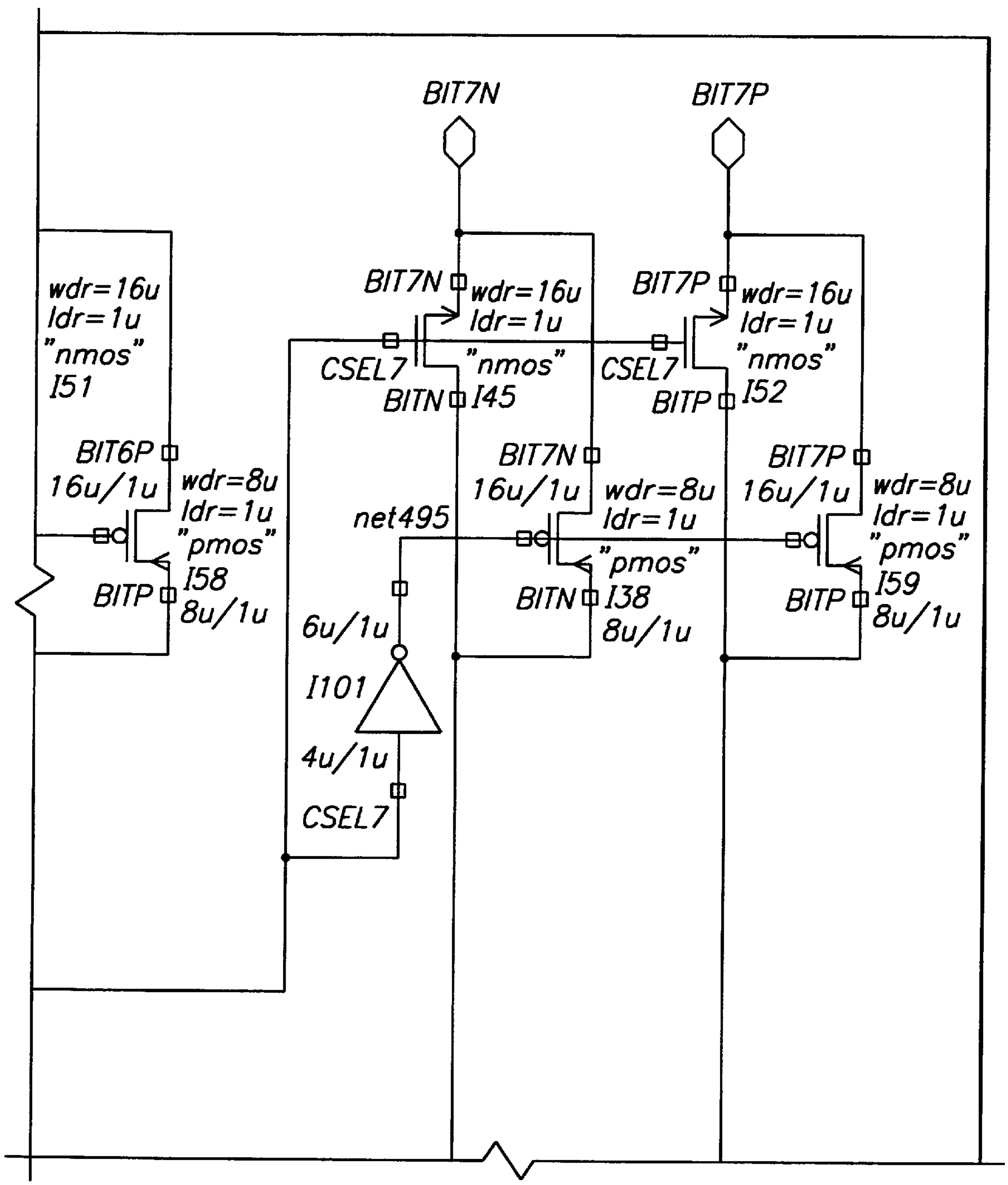
FIG. 1.0309AG

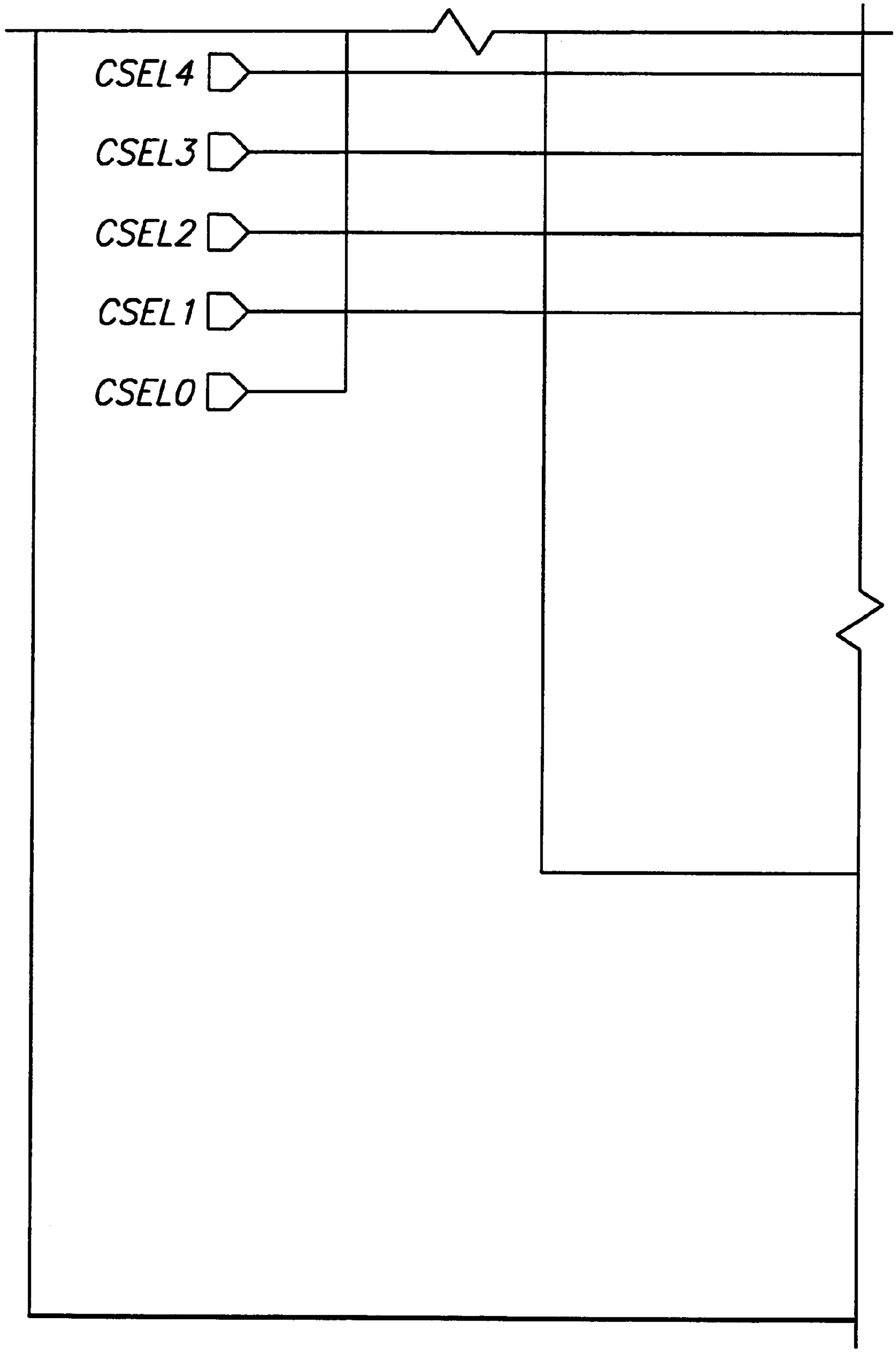
Fig 1.0309BA

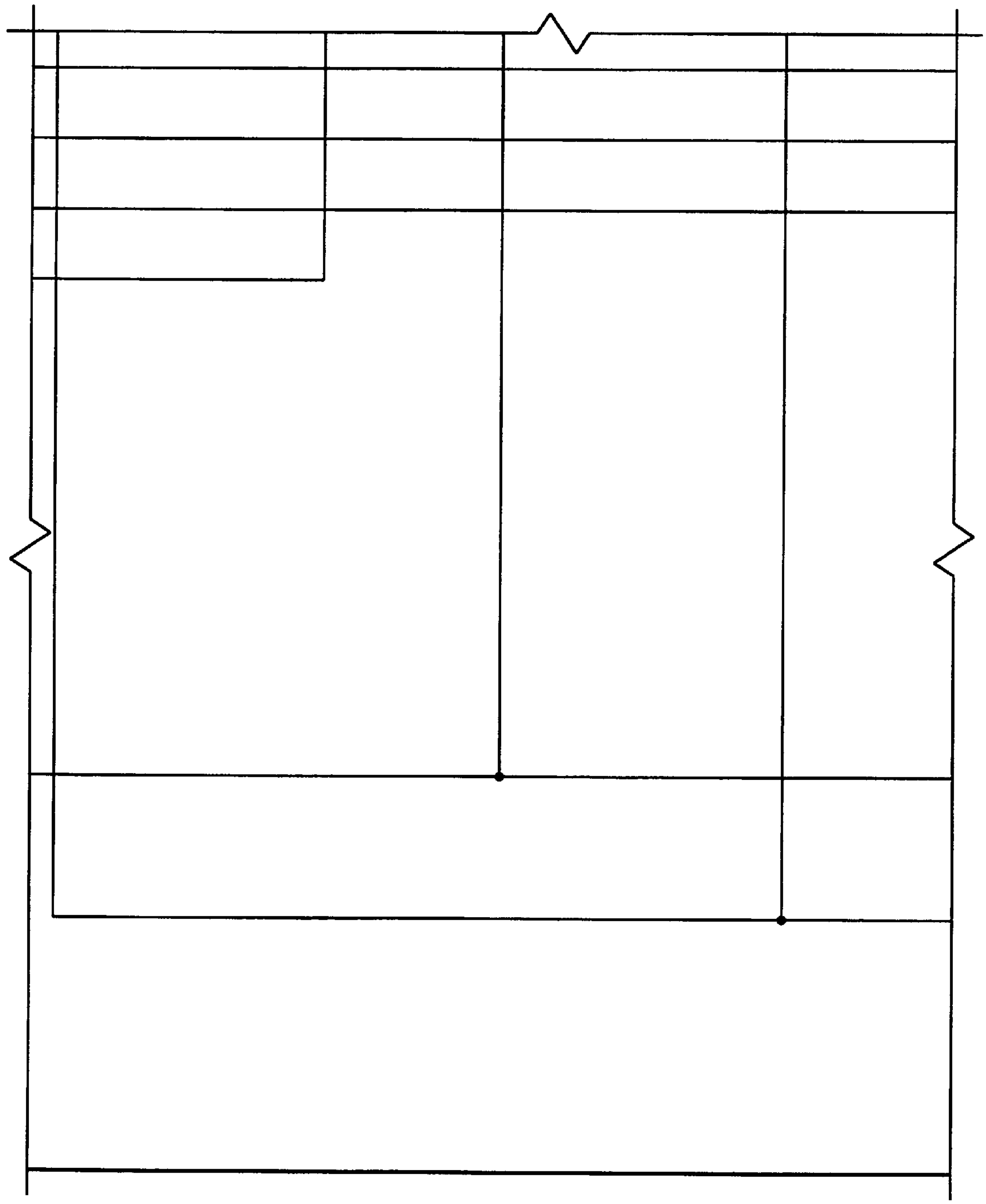
Fig 7.0309BB

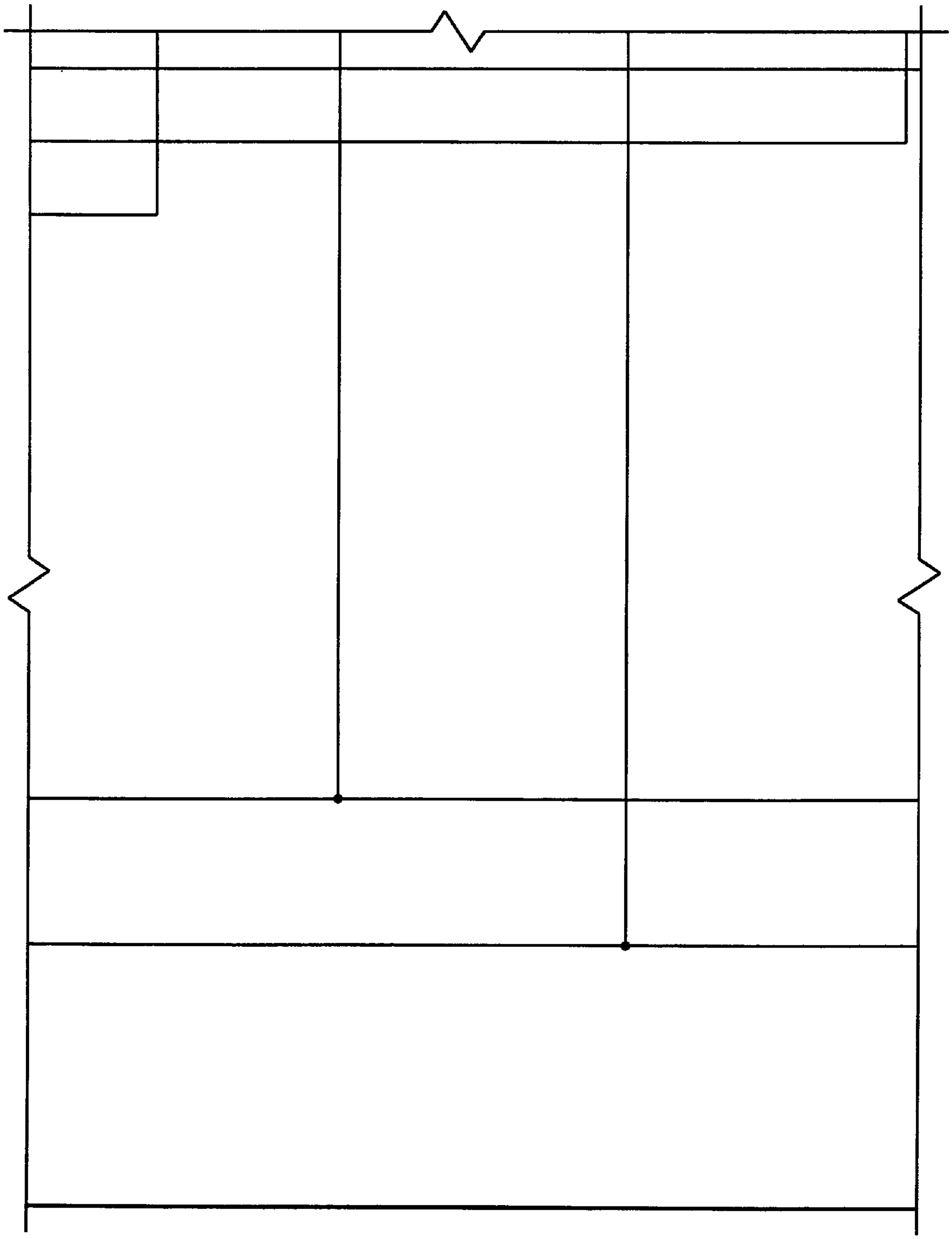
FIG. 7.0309BC

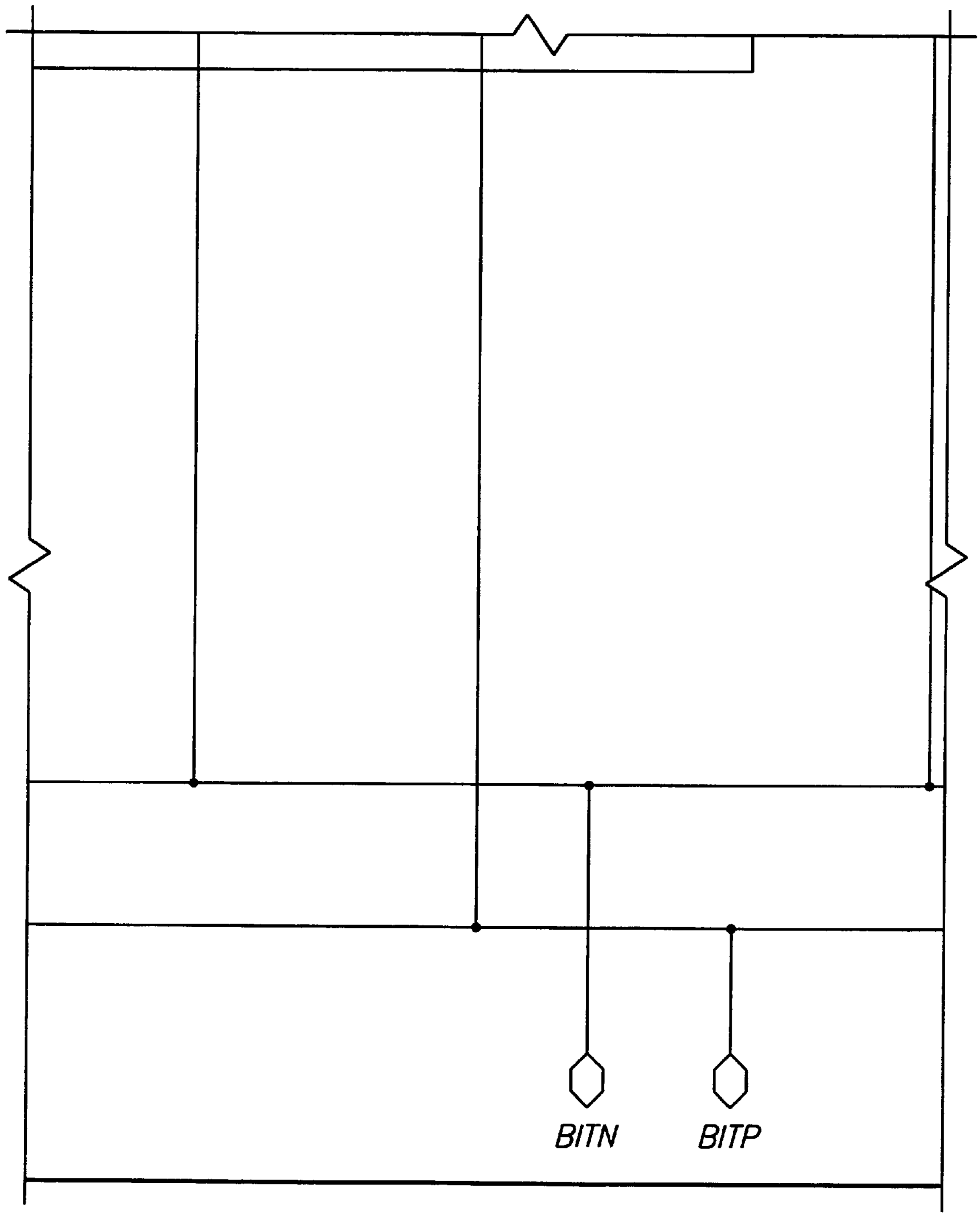
Fig 1.0309BD

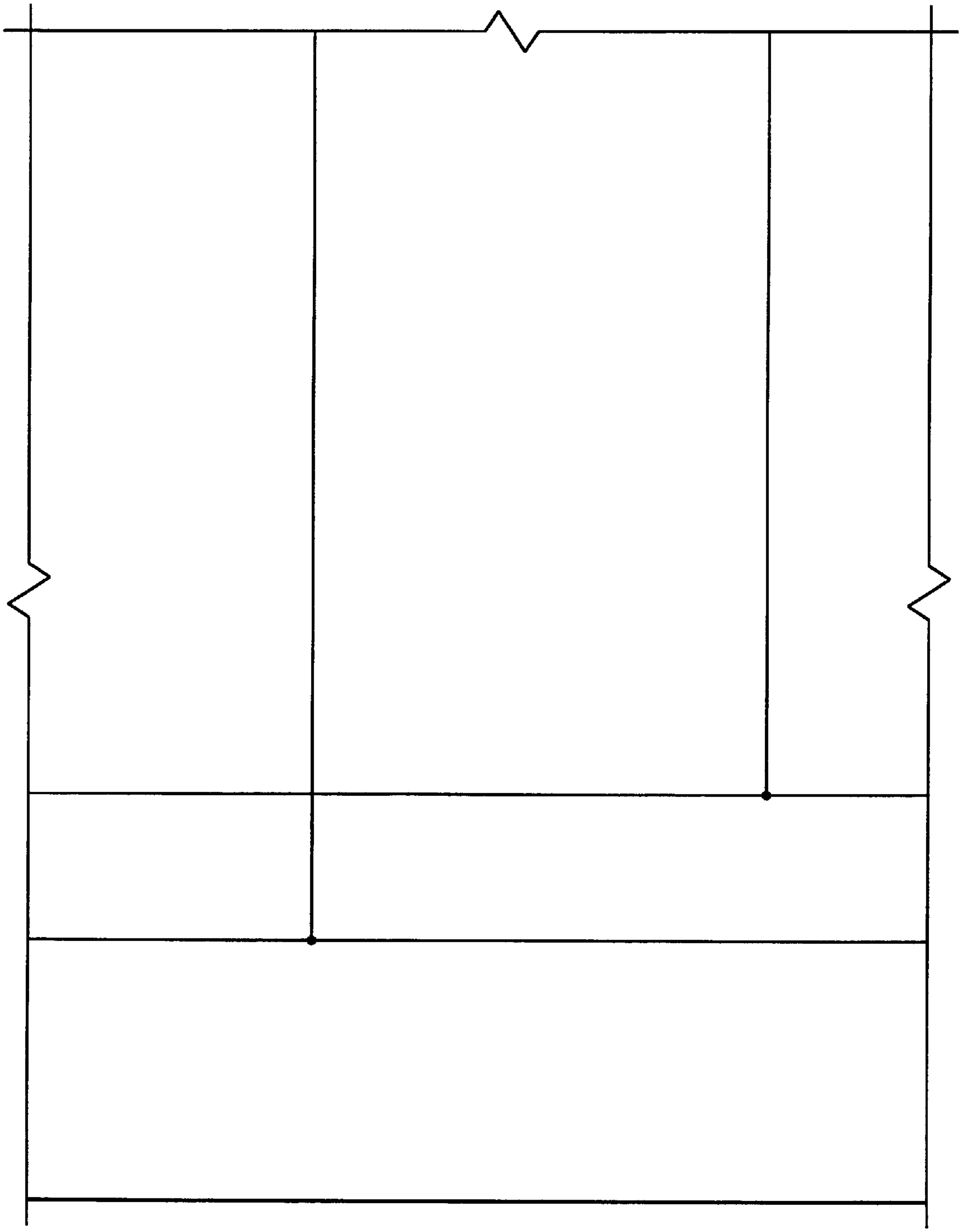
Fig 1.0309BE

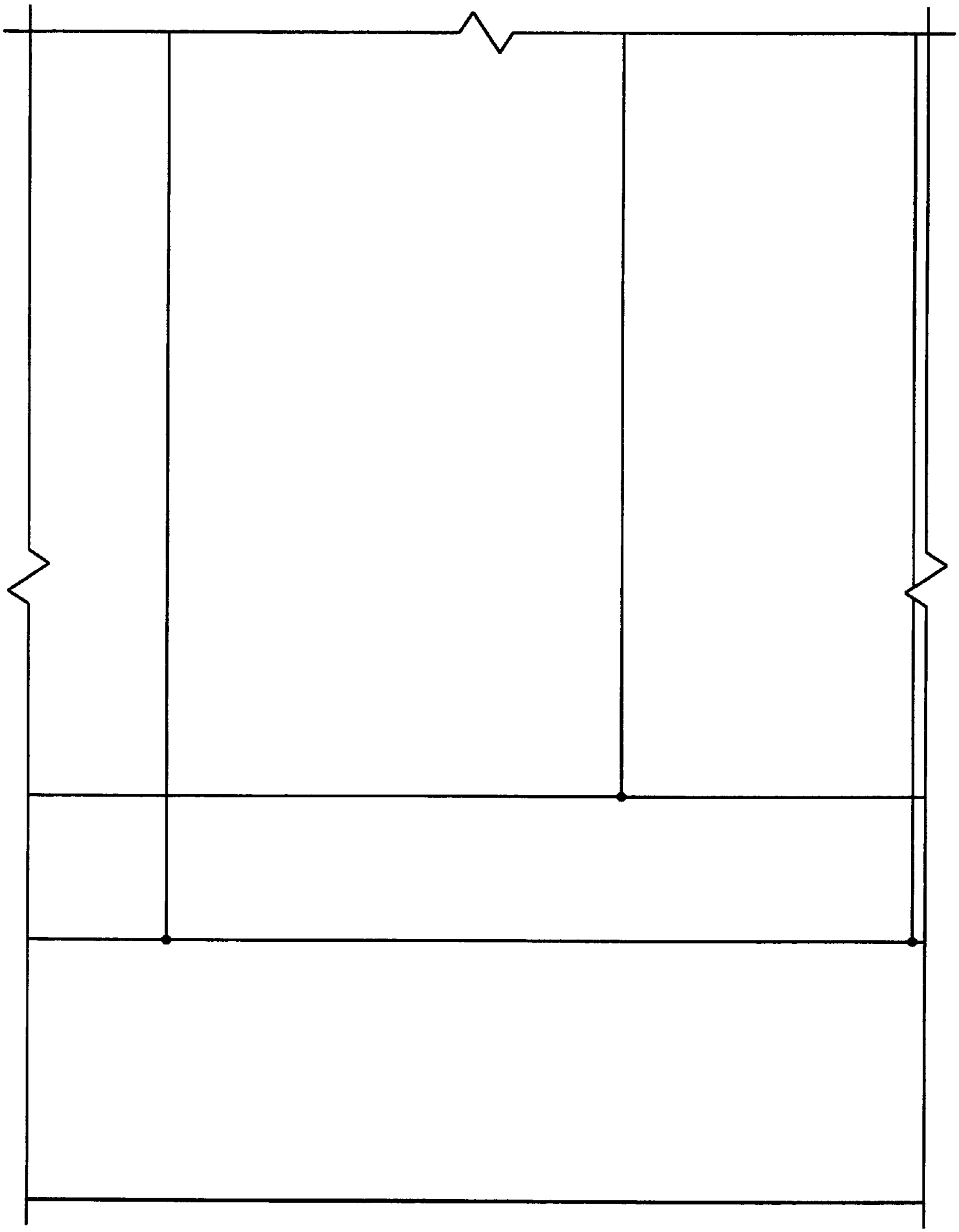
FIG 1.0309BF

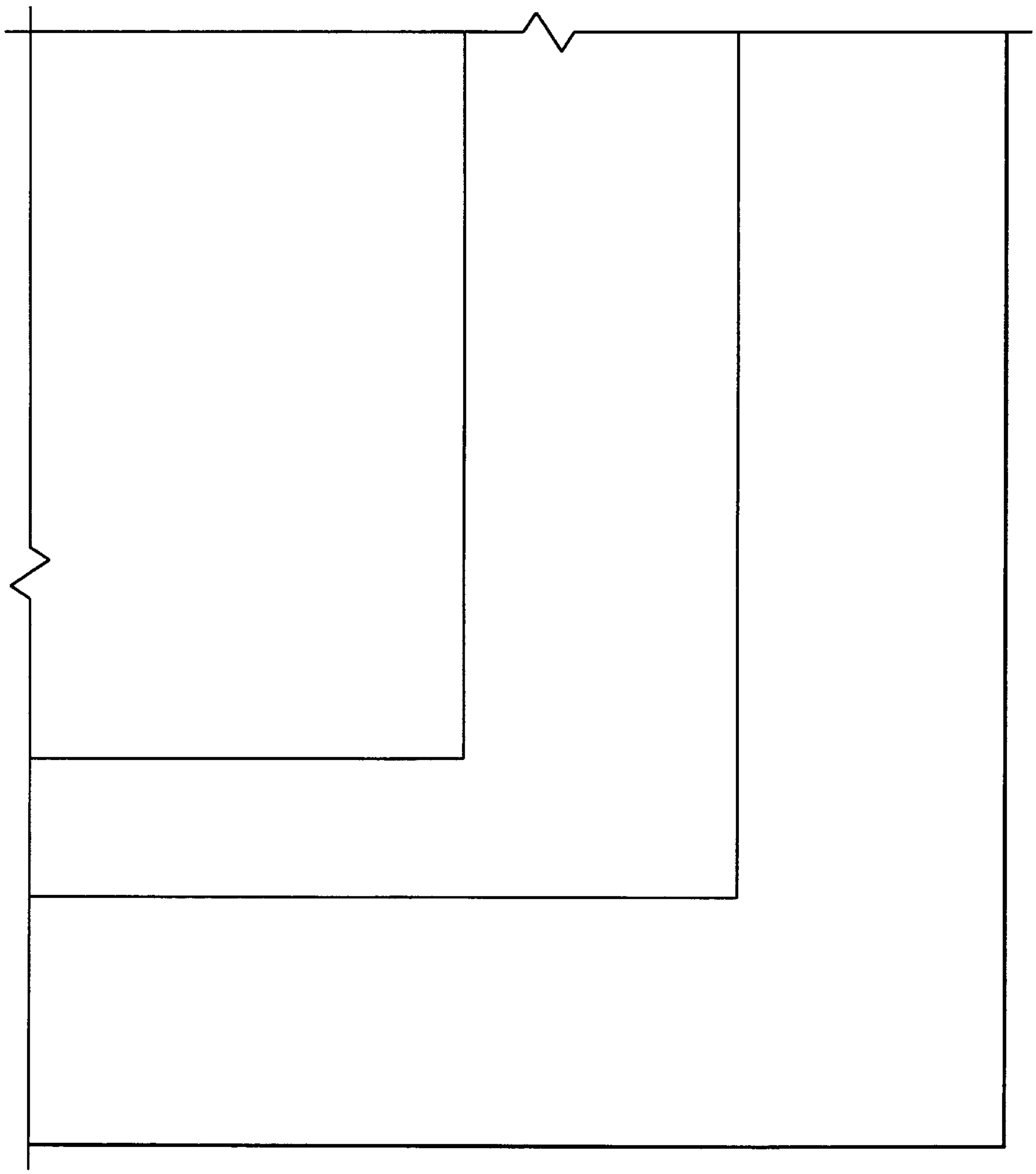
Fig 1.0309BG

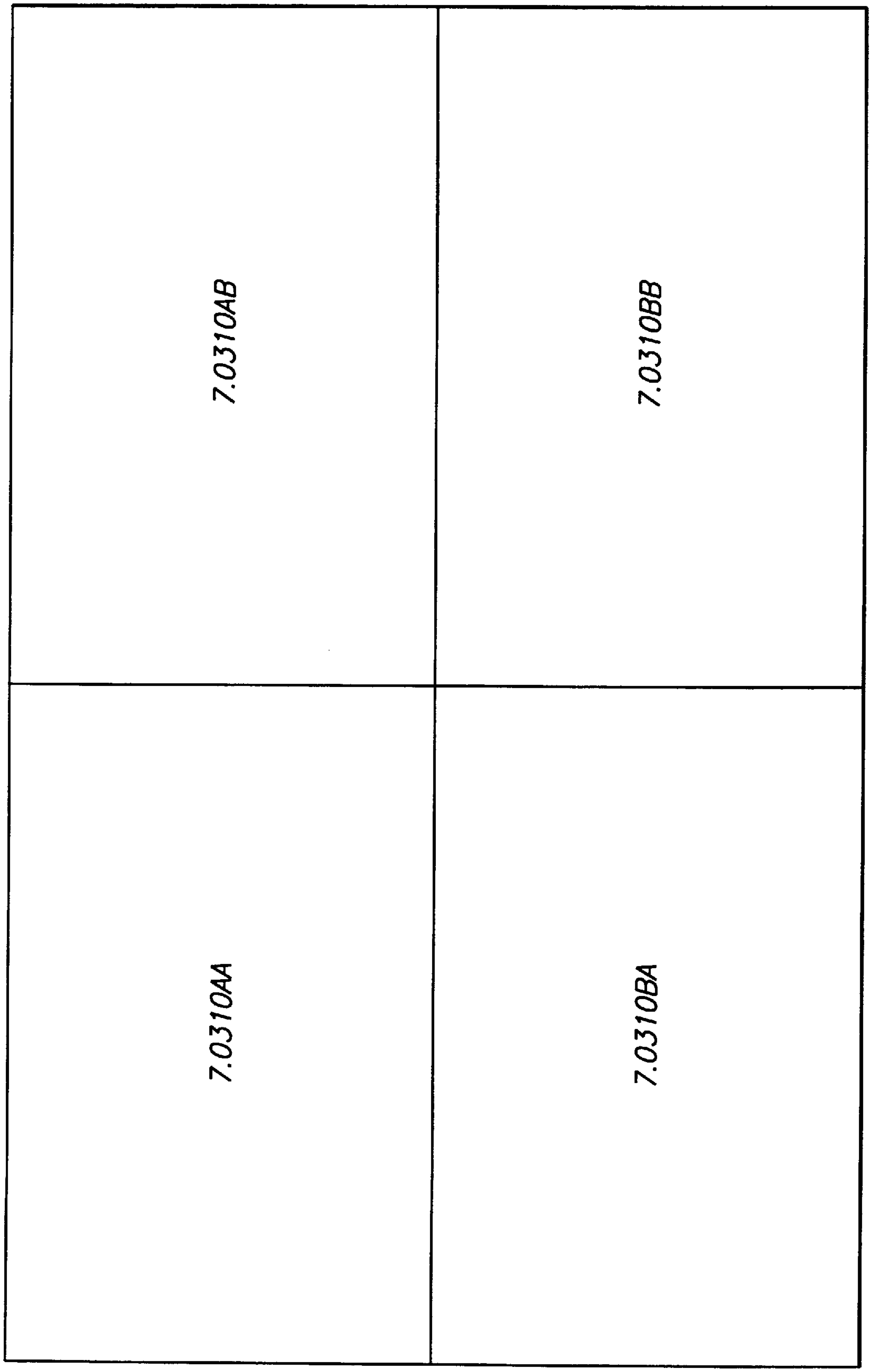
FIG. 7.0310

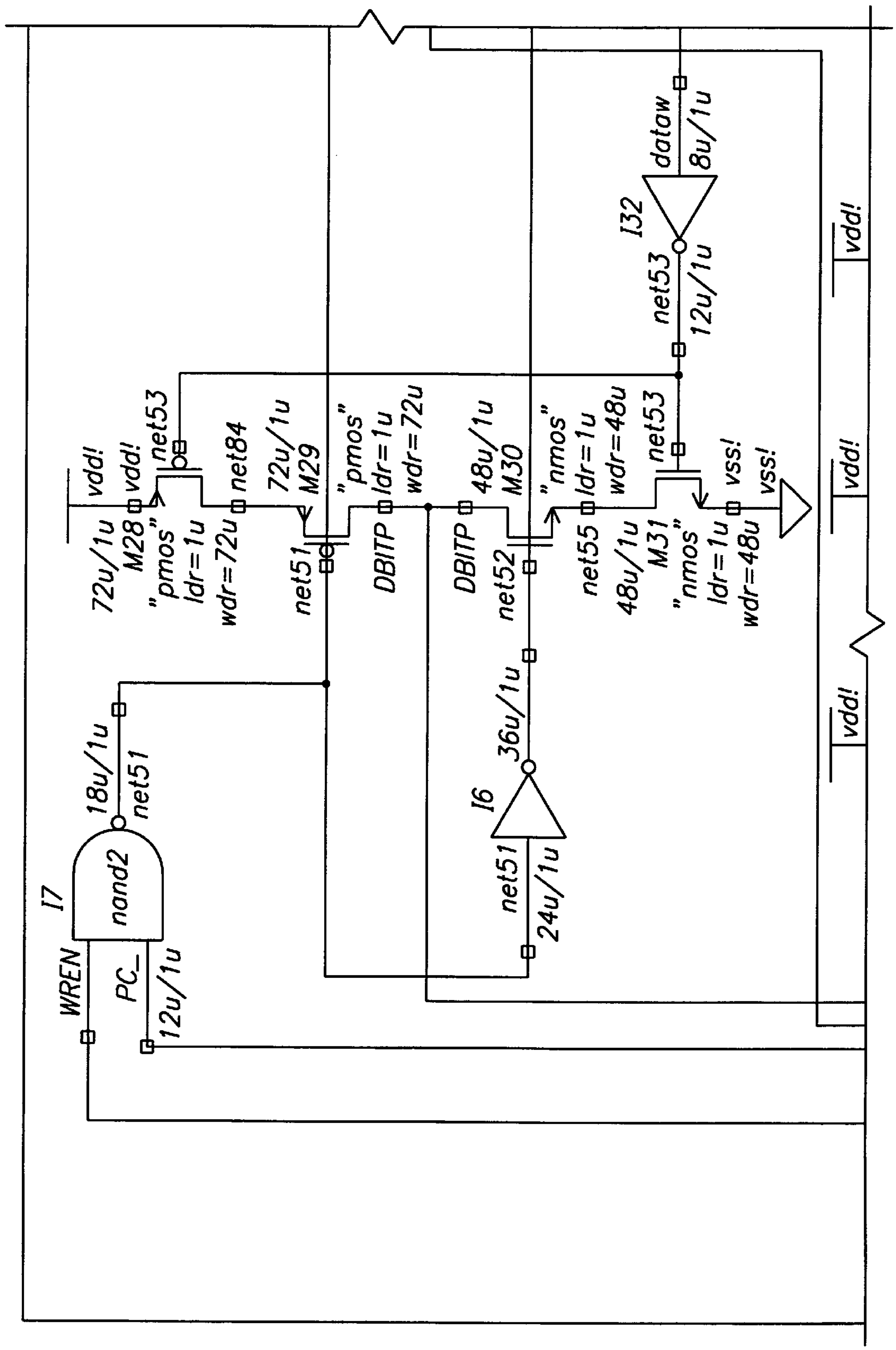
dataw
8u/1u
I32
net53
12u/1u
vdd!
vdd!
vdd!
net53
net84
72u/1u
M29
"pmos"
ldr=1u
wdr=72u
48u/1u
M30
"nmos"
ldr=1u
wdr=48u
net53
vss!
vss!
72u/1u
M28
"pmos"
ldr=1u
wdr=72u
net51
DBITP
DBITP
net52
net55
48u/1u
M31
"nmos"
ldr=1u
wdr=48u
36u/1u
I6
net51
24u/1u
18u/1u
net51
I7
nand2
WREN
PC_
12u/1u

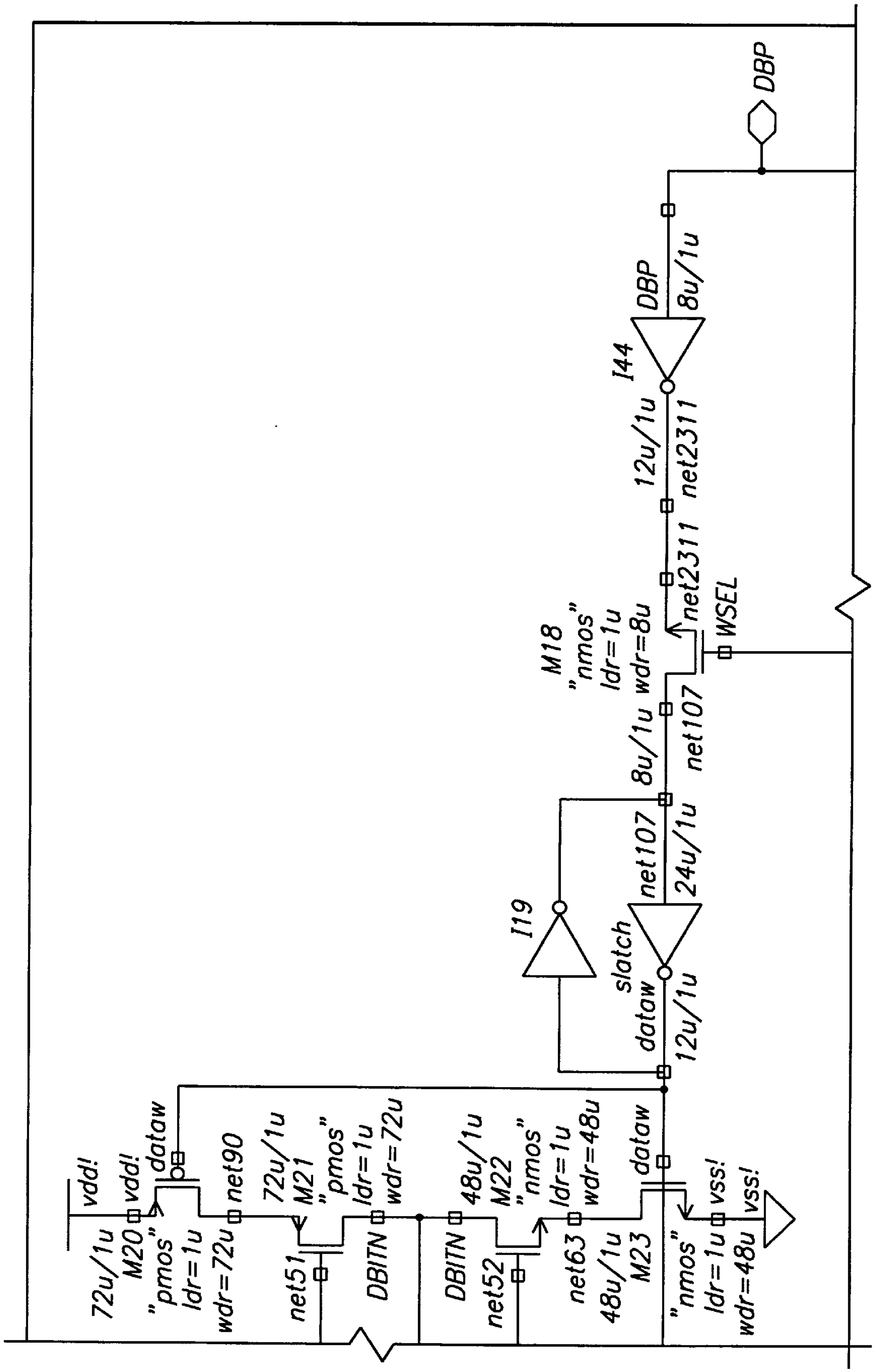
FIG. 7.01AB

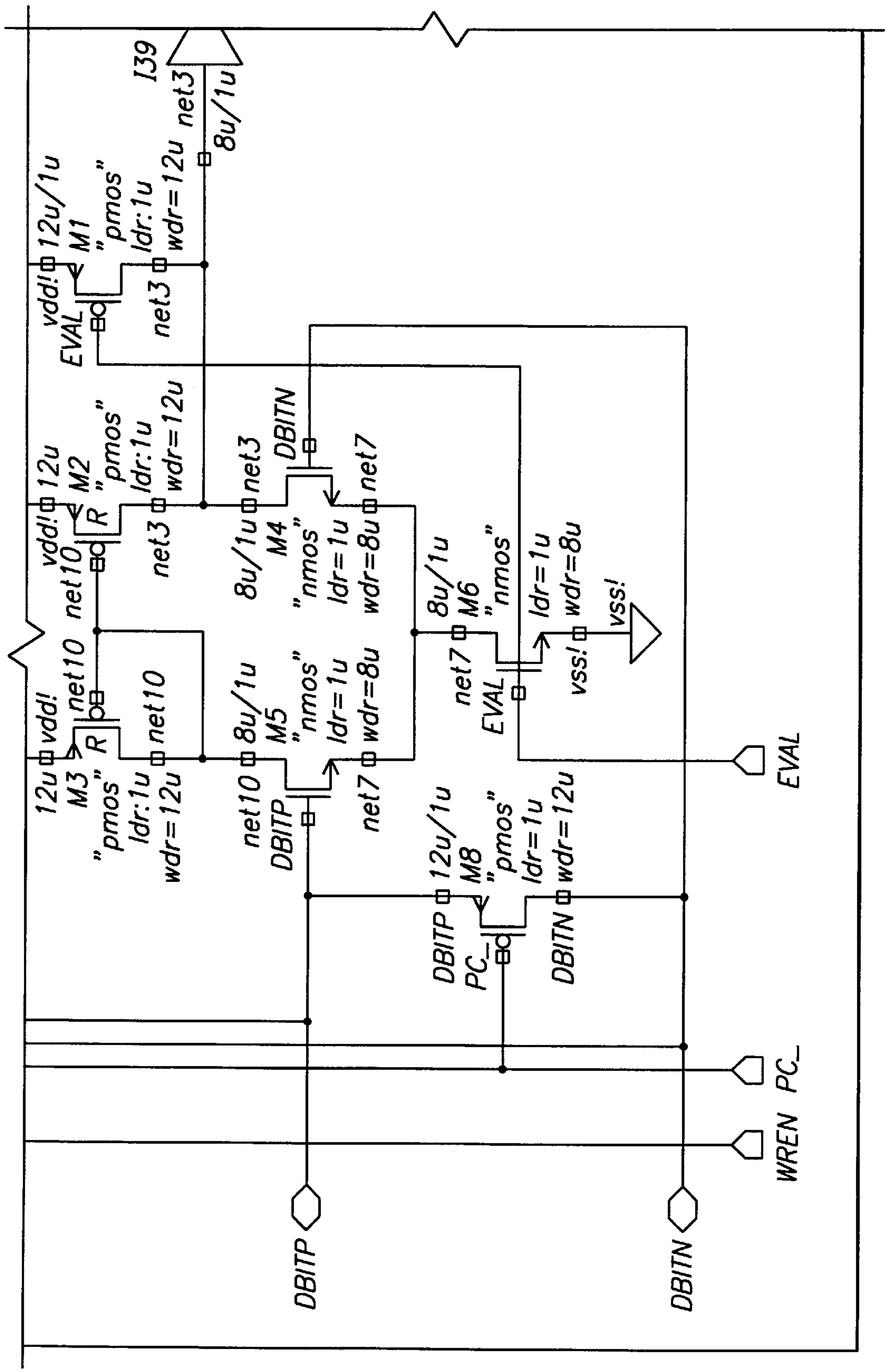
FIG. 7.0310BA

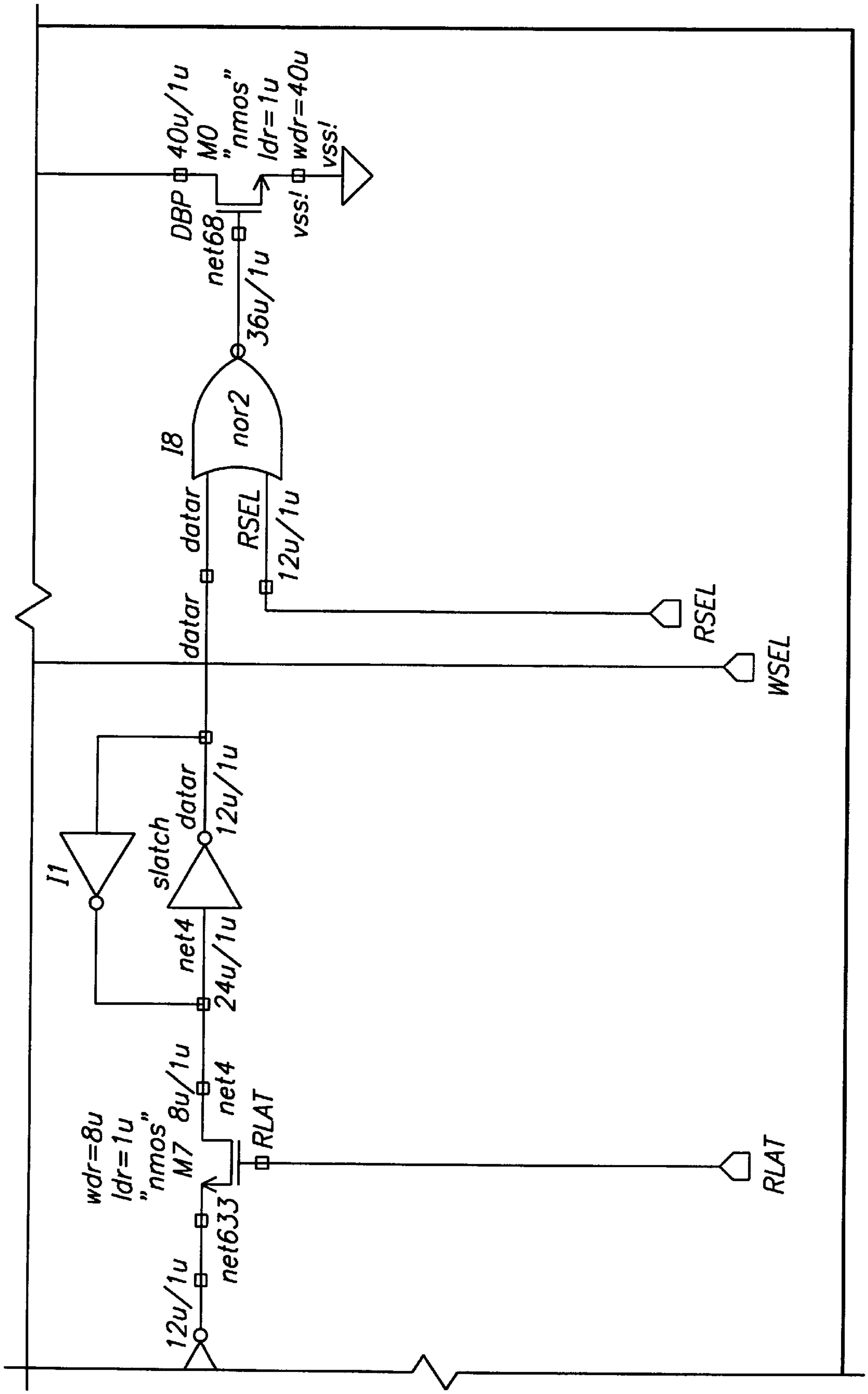
FIG. 7.0310BB

| | | | | | | | | | |
|---|---|---|---|---|---|---|---|---|---|
| 7.04AA | 7.04AB | 7.04AC | 7.04AD | 7.04AE | 7.04AF | 7.04AG | 7.04AH | 7.04AI | 7.04AJ |
| 7.04BA | 7.04BB | 7.04BC | 7.04BD | 7.04BE | 7.04BF | 7.04BG | 7.04BH | 7.04BI | 7.04BJ |
| 7.04CA | 7.04CB | 7.04CC | 7.04CD | 7.04CE | 7.04CF | 7.04CG | 7.04CH | 7.04CI | 7.04CJ |
| 7.04DA | 7.04DB | 7.04DC | 7.04DD | 7.04DE | 7.04DF | 7.04DG | 7.04DH | 7.04DI | 7.04DJ |
| 7.04EA | 7.04EB | 7.04EC | 7.04ED | 7.04EE | 7.04EF | 7.04EG | 7.04EH | 7.04EI | 7.04EJ |
| 7.04FA | 7.04FB | 7.04FC | 7.04FD | 7.04FE | 7.04FF | 7.04FG | 7.04FH | 7.04FI | 7.04FJ |
| 7.04GA | 7.04GB | 7.04GC | 7.04GD | 7.04GE | 7.04GF | 7.04GG | 7.04GH | 7.04GI | 7.04GJ |
| 7.04HA | 7.04HB | 7.04HC | 7.04HD | 7.04HE | 7.04HF | 7.04HG | 7.04HH | 7.04HI | 7.04HJ |

Fig. 7.04

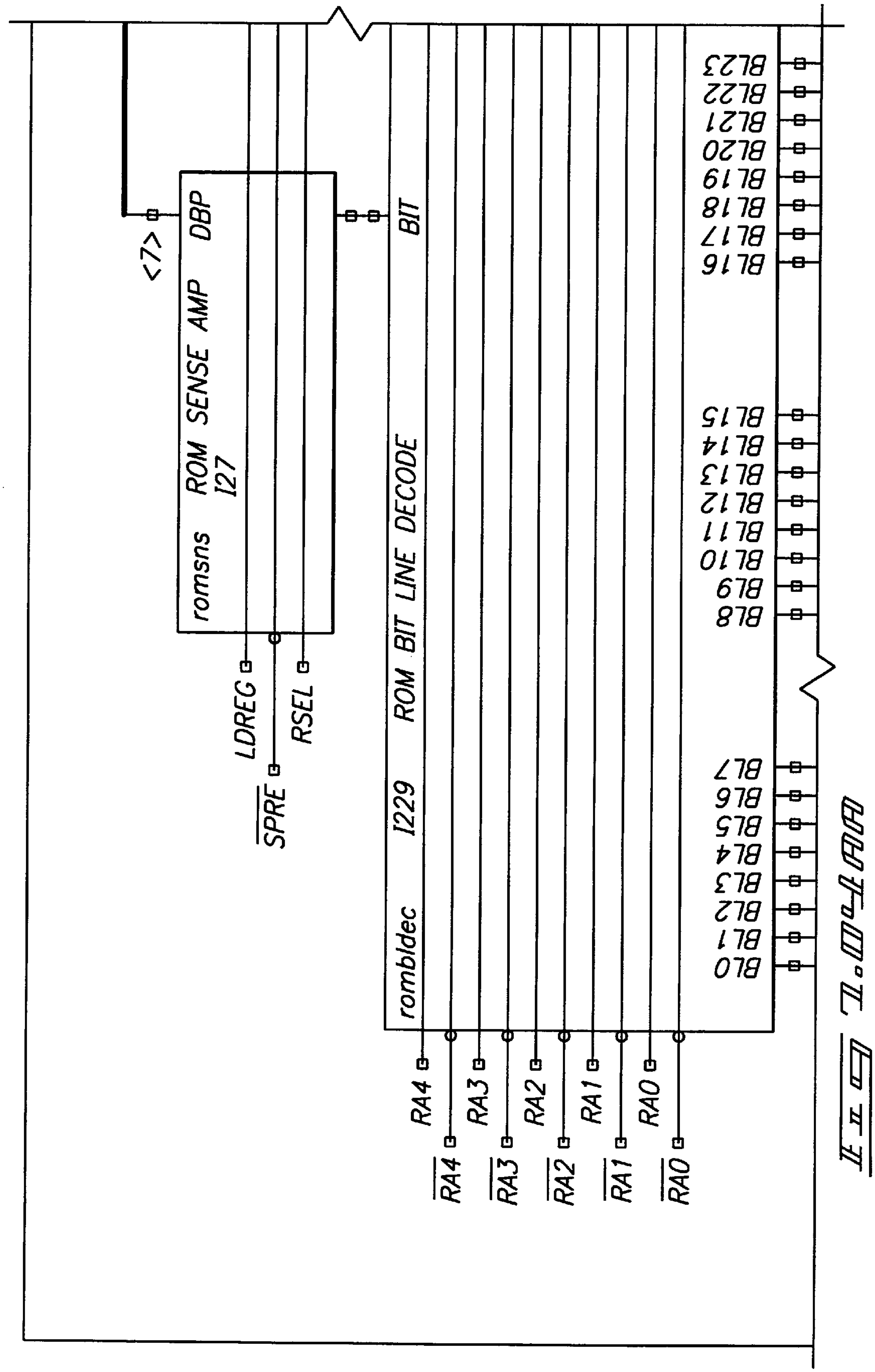
romsns ROM SENSE AMP I27
DBP
<7>
LDREG
SPRE
RSEL
rombldec I229 ROM BIT LINE DECODE
BIT
RA4
RA3
RA2
RA1
RA0
BL0
BL1
BL2
BL3
BL4
BL5
BL6
BL7
BL8
BL9
BL10
BL11
BL12
BL13
BL14
BL15
BL16
BL17
BL18
BL19
BL20
BL21
BL22
BL23

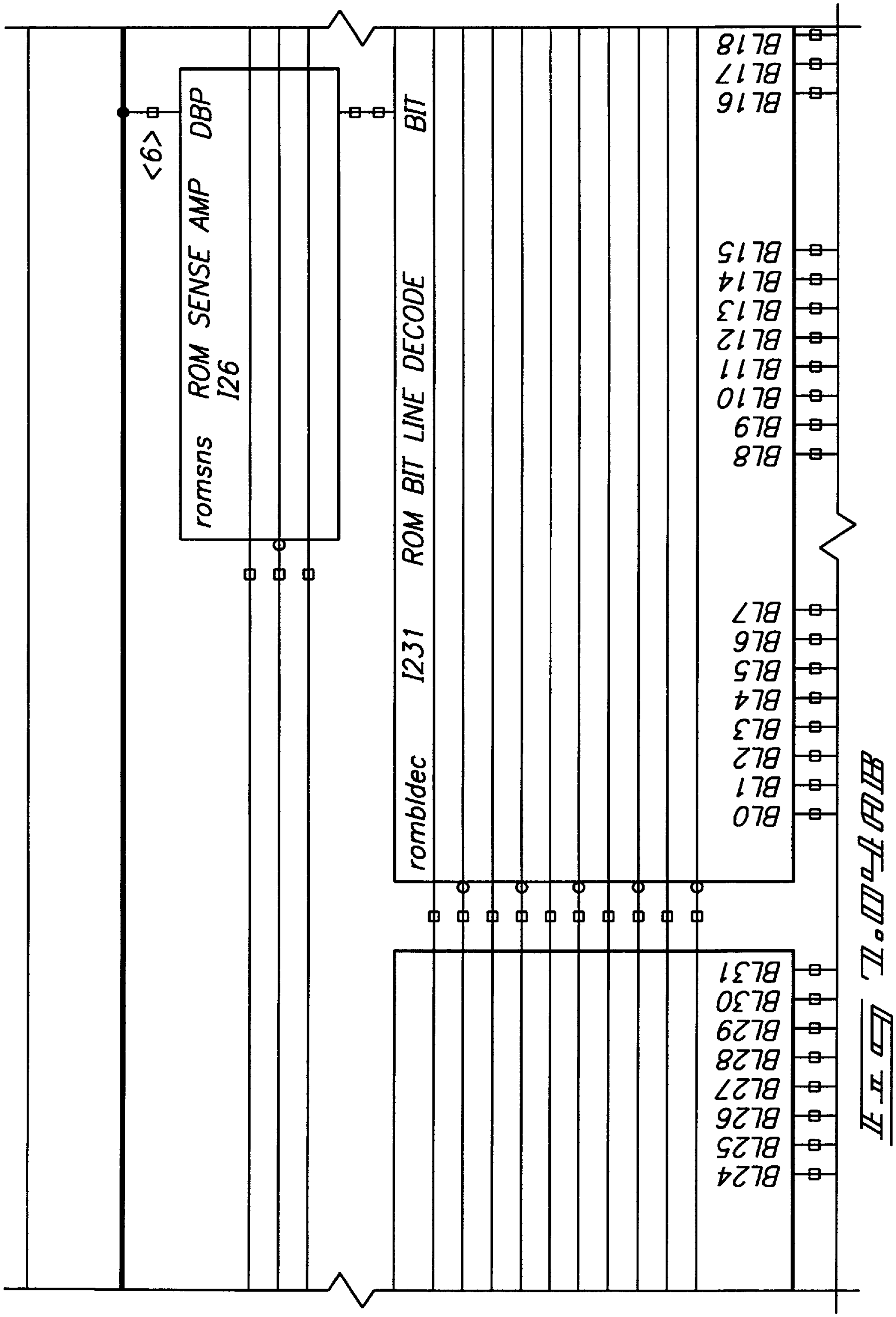
FIG. 7.04AB

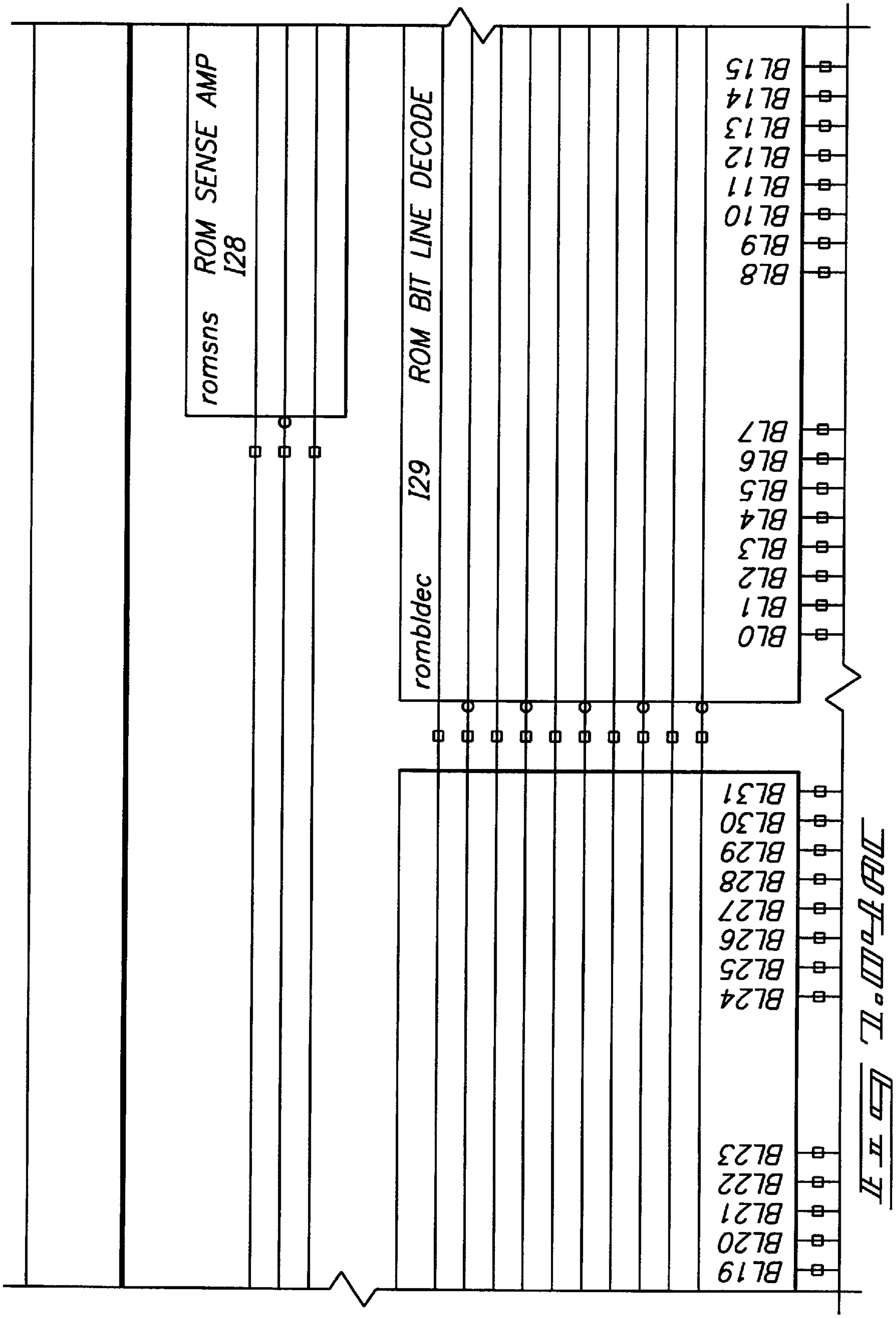
romsns
ROM SENSE AMP
I28
rombldec
ROM BIT LINE DECODE
I29
BL15
BL14
BL13
BL12
BL11
BL10
BL9
BL8
BL7
BL6
BL5
BL4
BL3
BL2
BL1
BL0
BL31
BL30
BL29
BL28
BL27
BL26
BL25
BL24
BL23
BL22
BL21
BL20
BL19

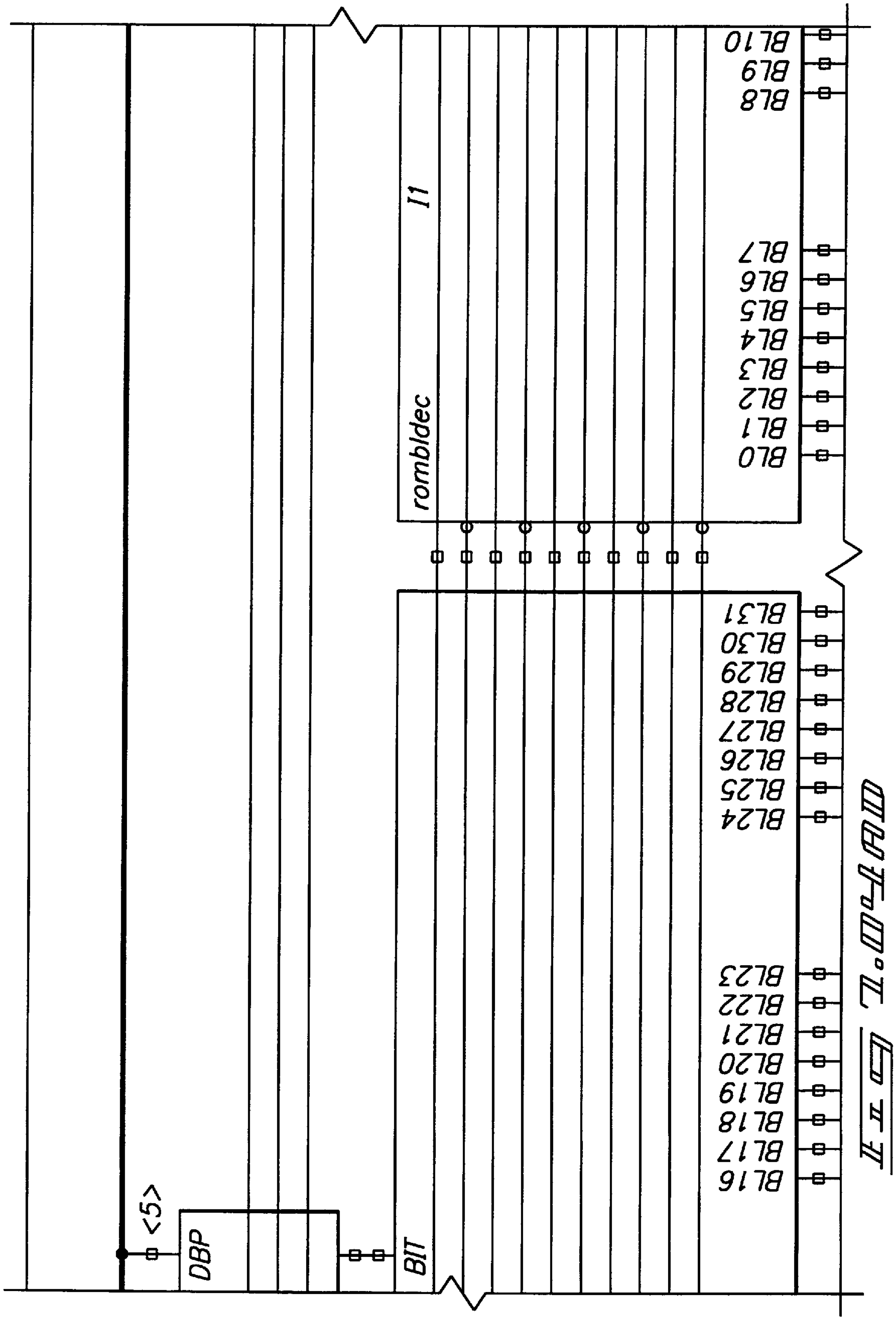
rombldec
I1
BL0
BL1
BL2
BL3
BL4
BL5
BL6
BL7
BL8
BL9
BL10
BL16
BL17
BL18
BL19
BL20
BL21
BL22
BL23
BL24
BL25
BL26
BL27
BL28
BL29
BL30
BL31
DBP
<5>
BIT

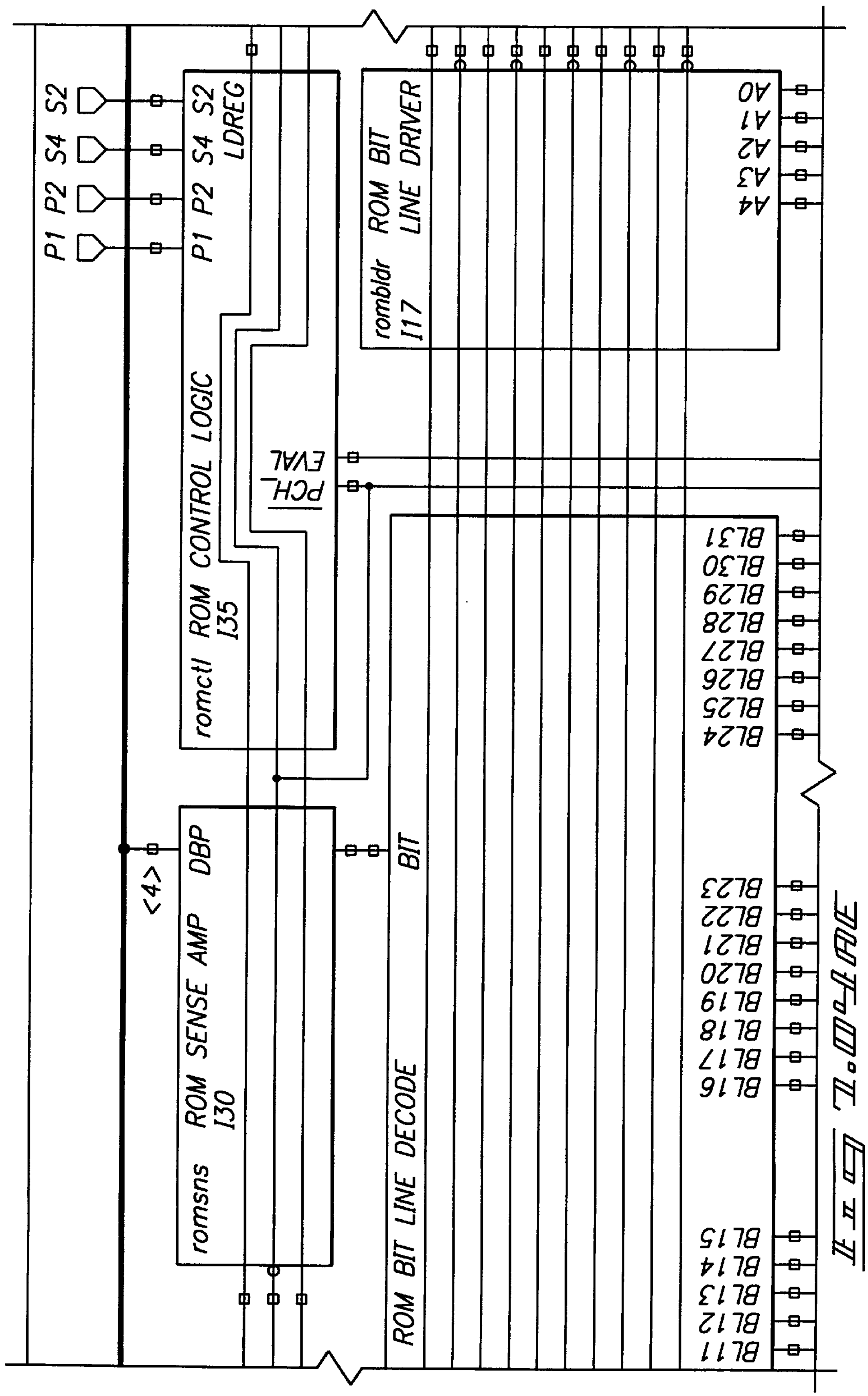
Fig. 7.04AE

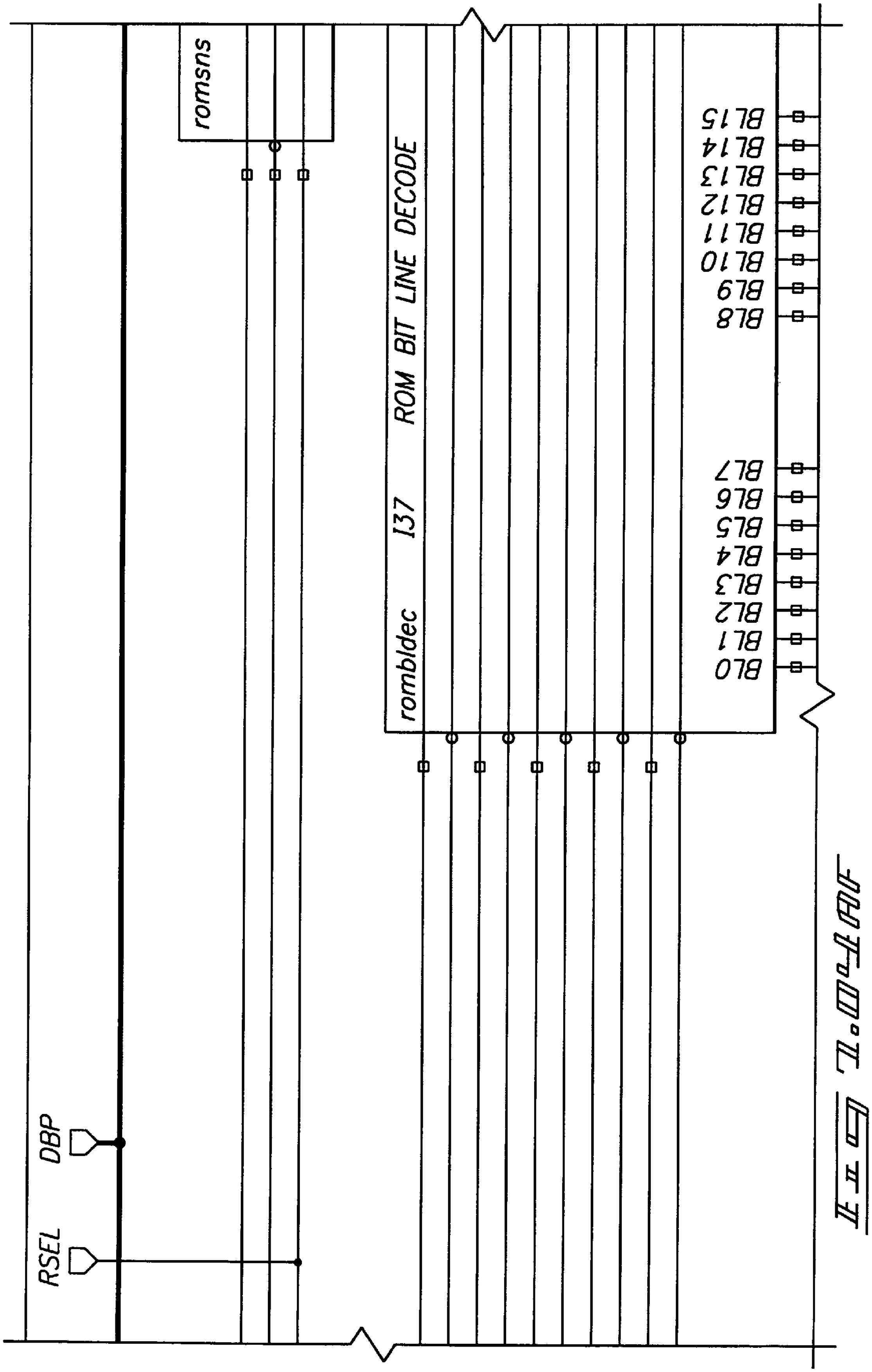
romsns
rombldec 137 ROM BIT LINE DECODE
BL0
BL1
BL2
BL3
BL4
BL5
BL6
BL7
BL8
BL9
BL10
BL11
BL12
BL13
BL14
BL15
DBP
RSEL

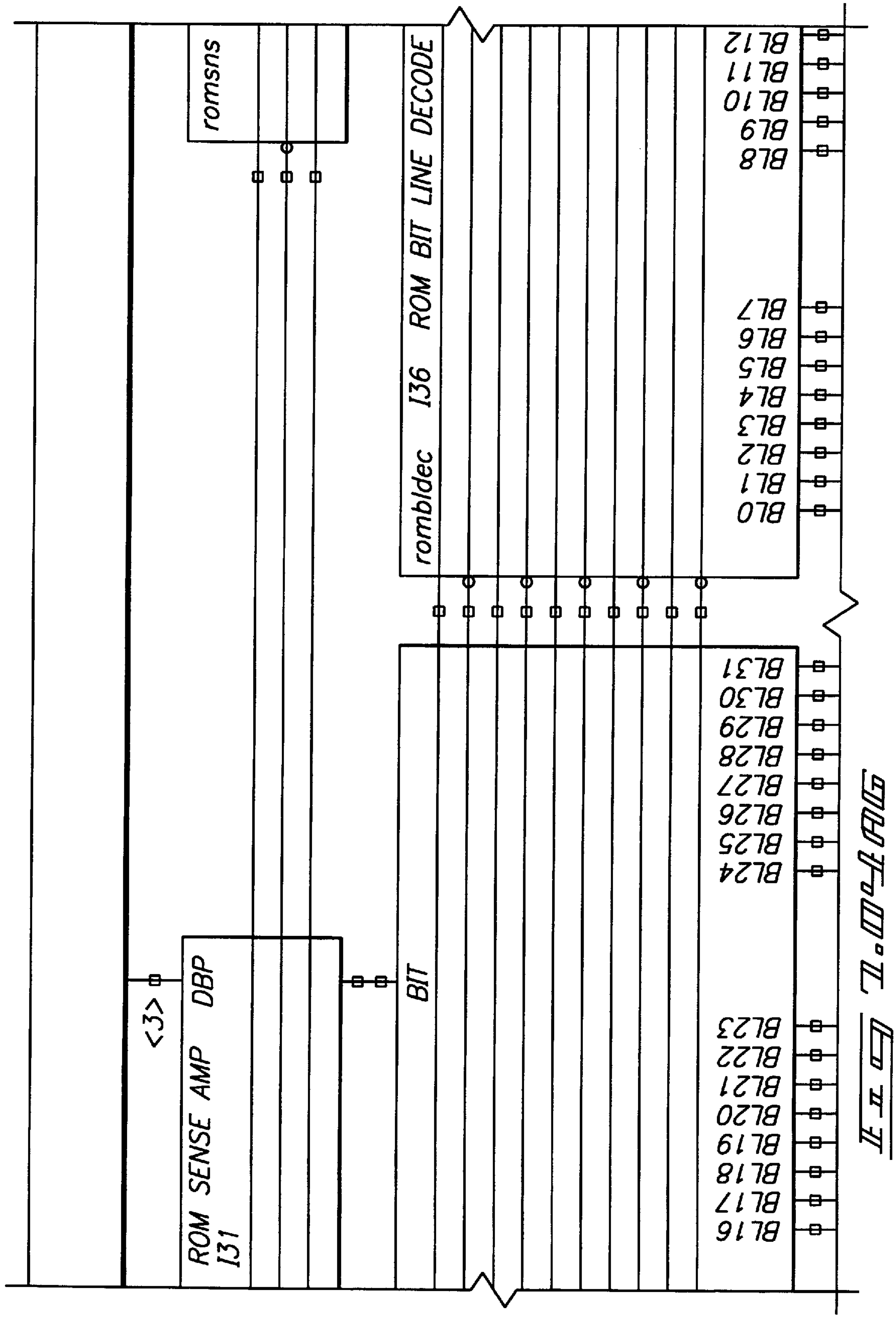
FIG. 7.04AG

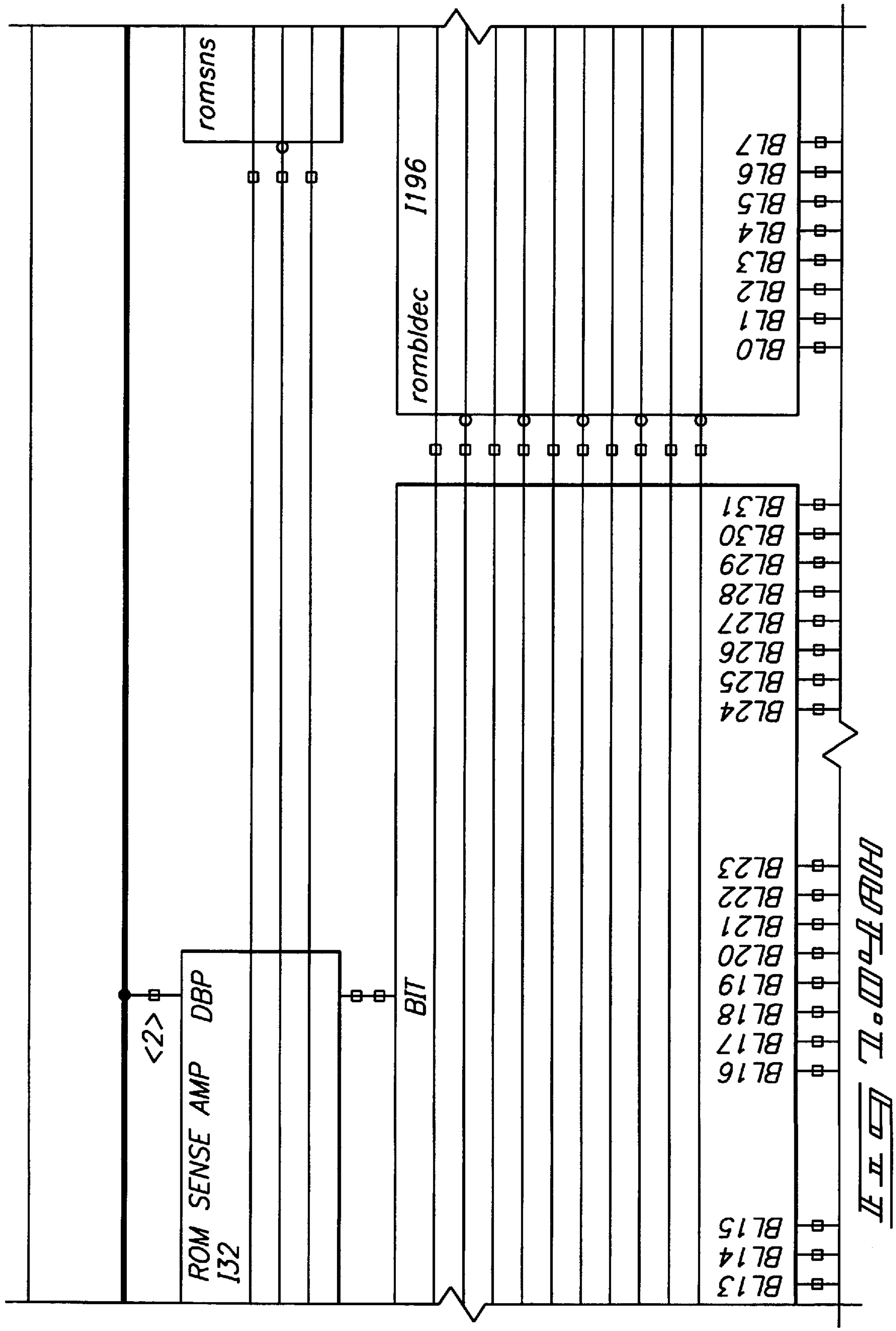
romsns
rombldec I196
BL0
BL1
BL2
BL3
BL4
BL5
BL6
BL7
BL31
BL30
BL29
BL28
BL27
BL26
BL25
BL24
BL23
BL22
BL21
BL20
BL19
BL18
BL17
BL16
BL15
BL14
BL13
<2>
DBP
BIT
ROM SENSE AMP
I32

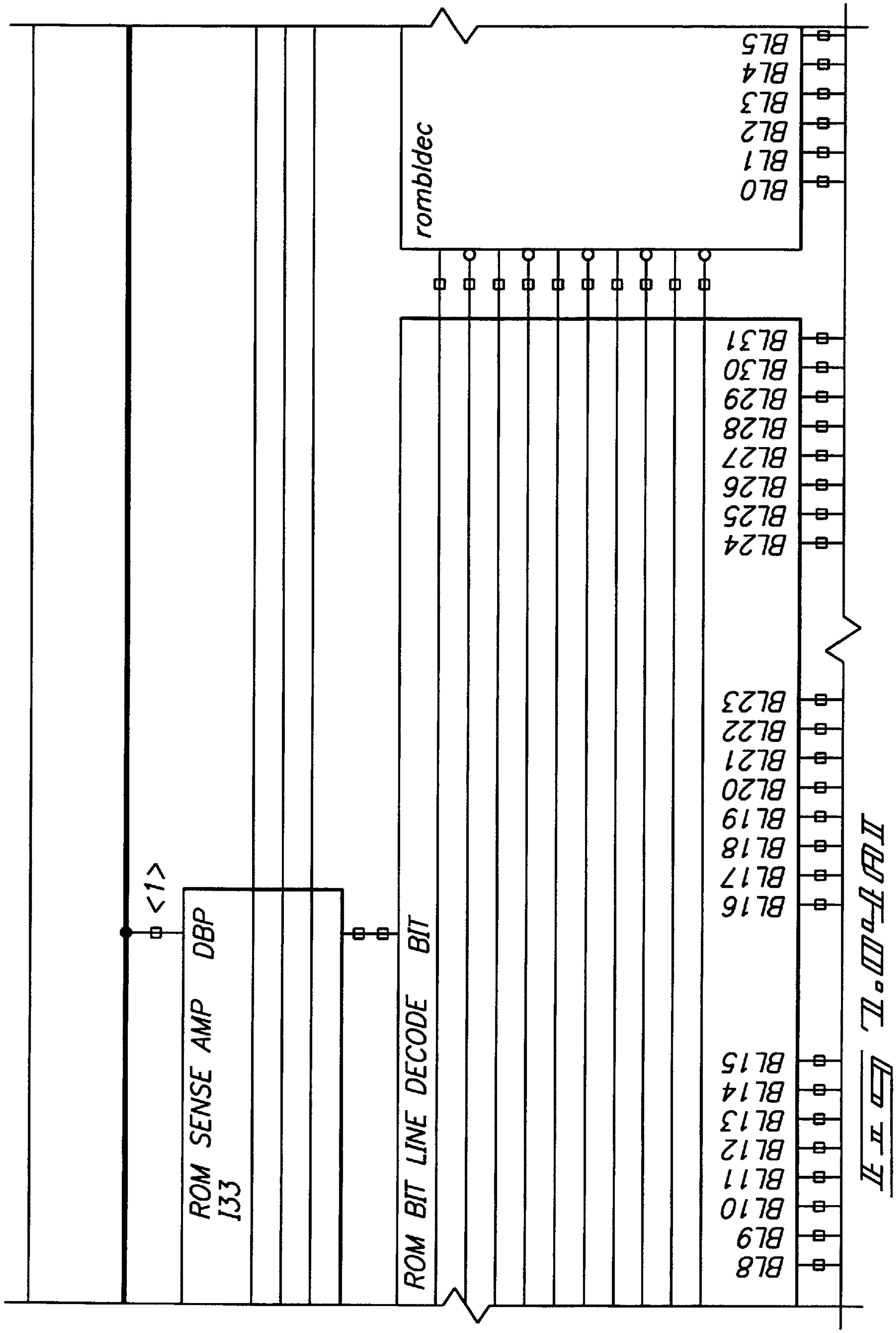
FIG. 1.04AI

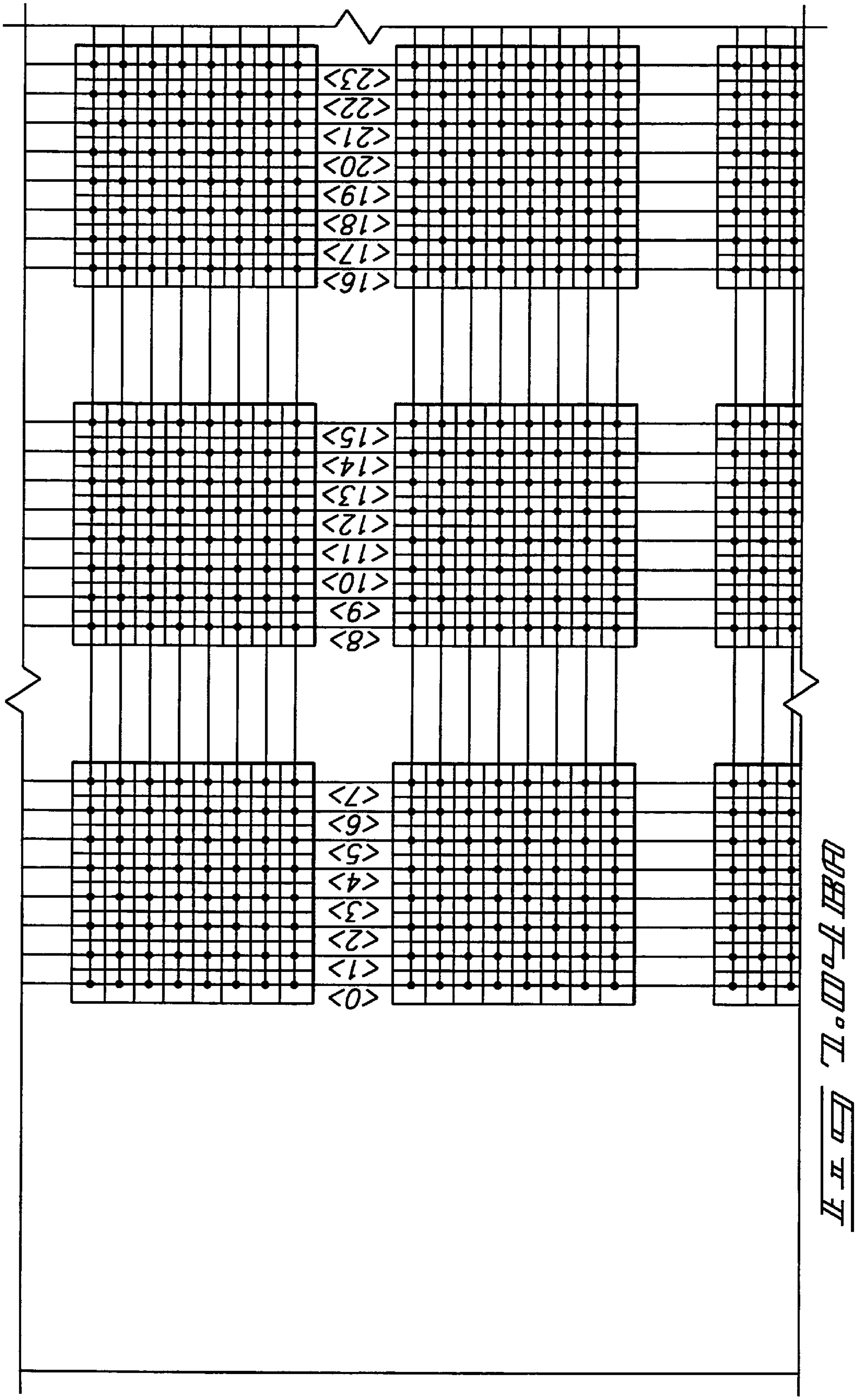
FIG. 1.07BA

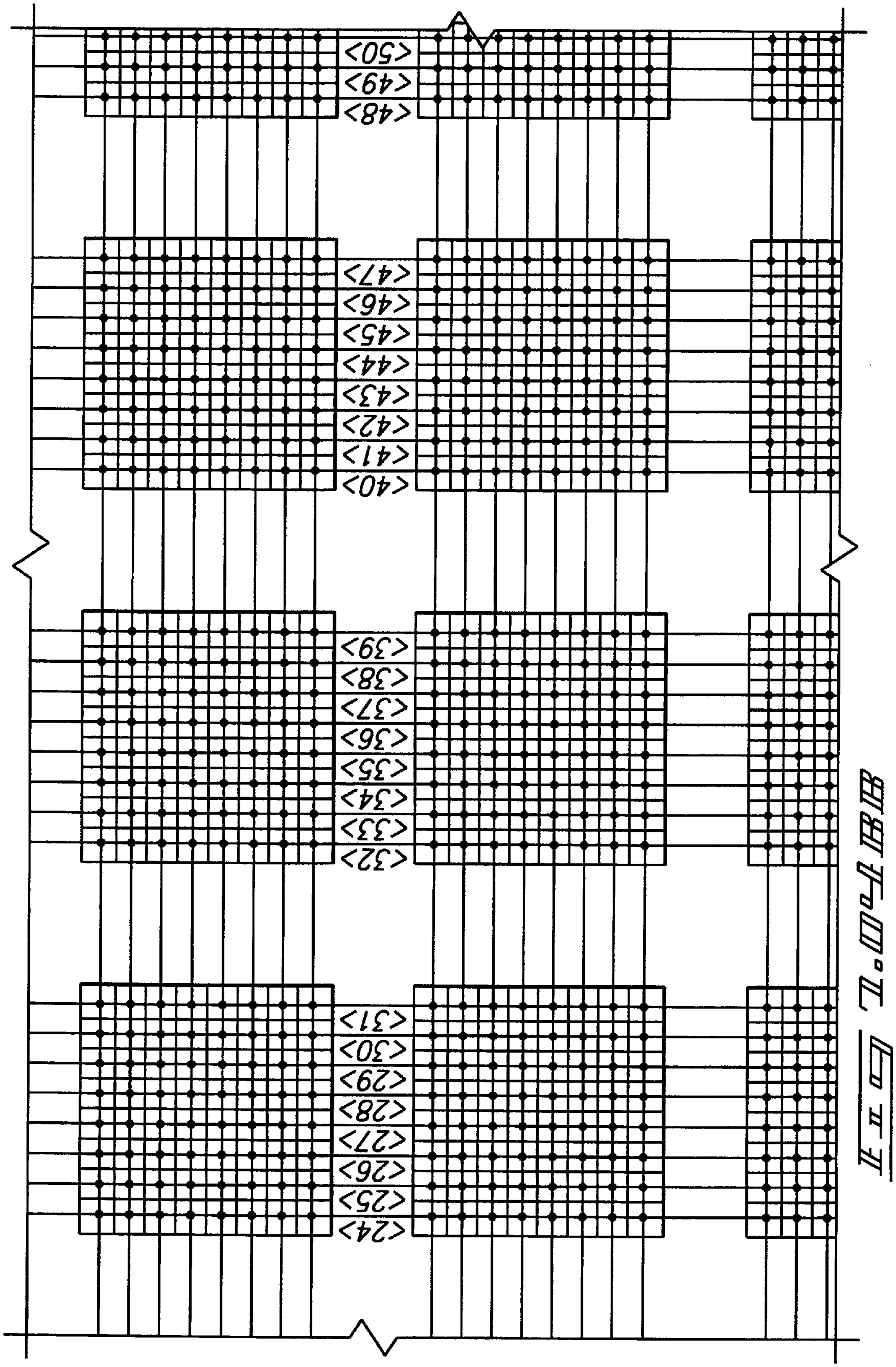
Fig. 7.04BB

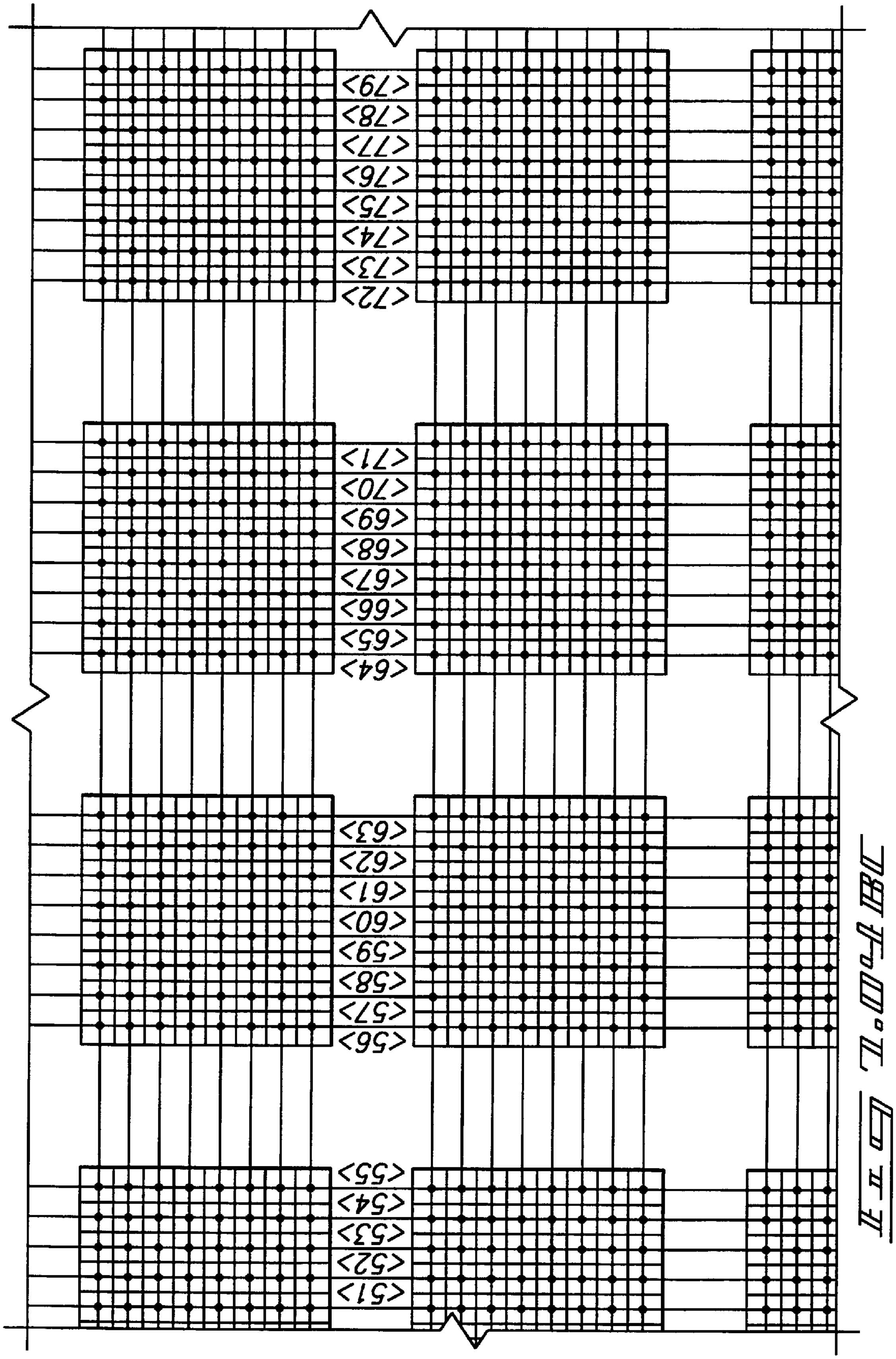
FIG. 7.04BC

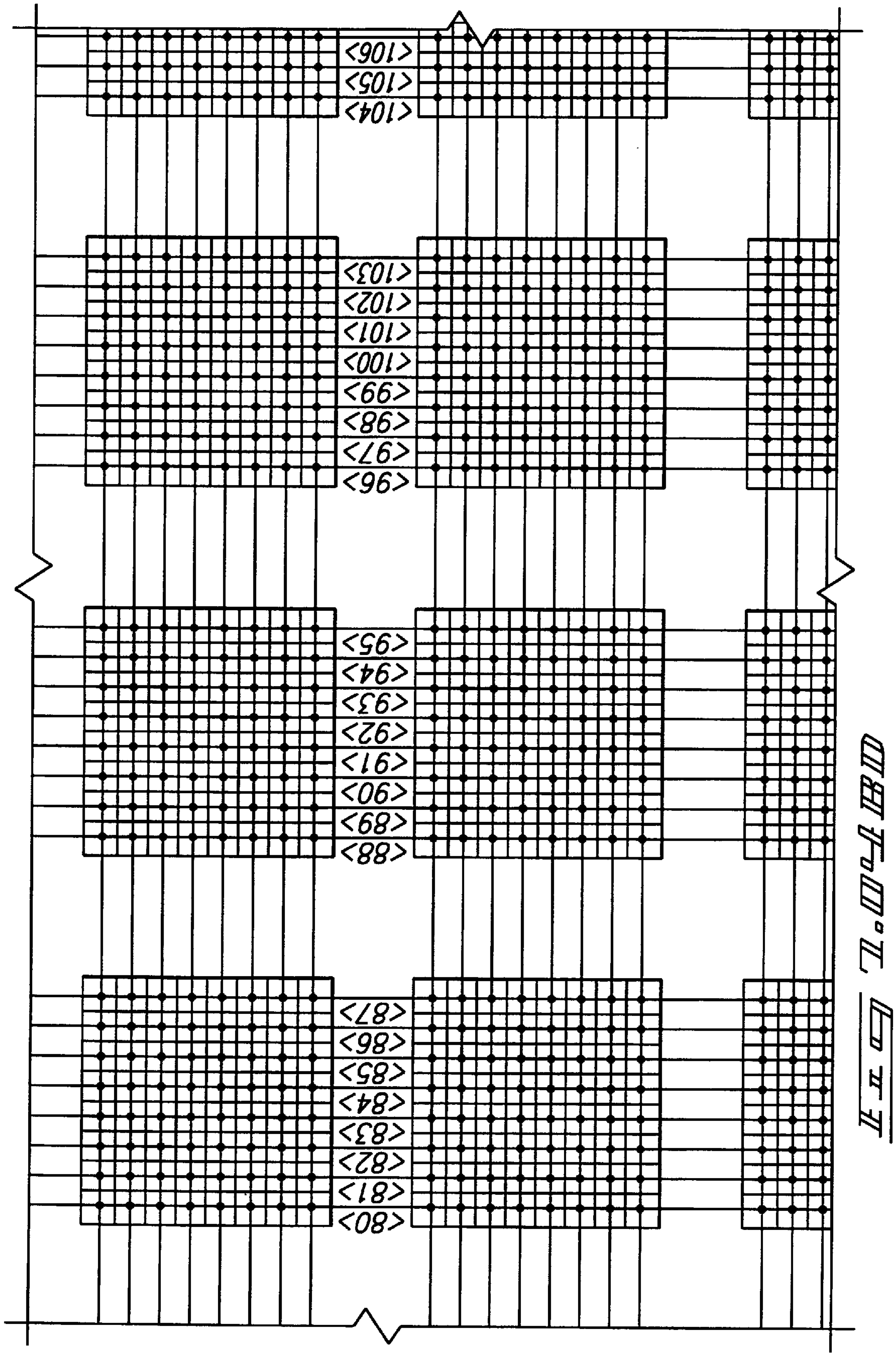
FIG. 7.04BD

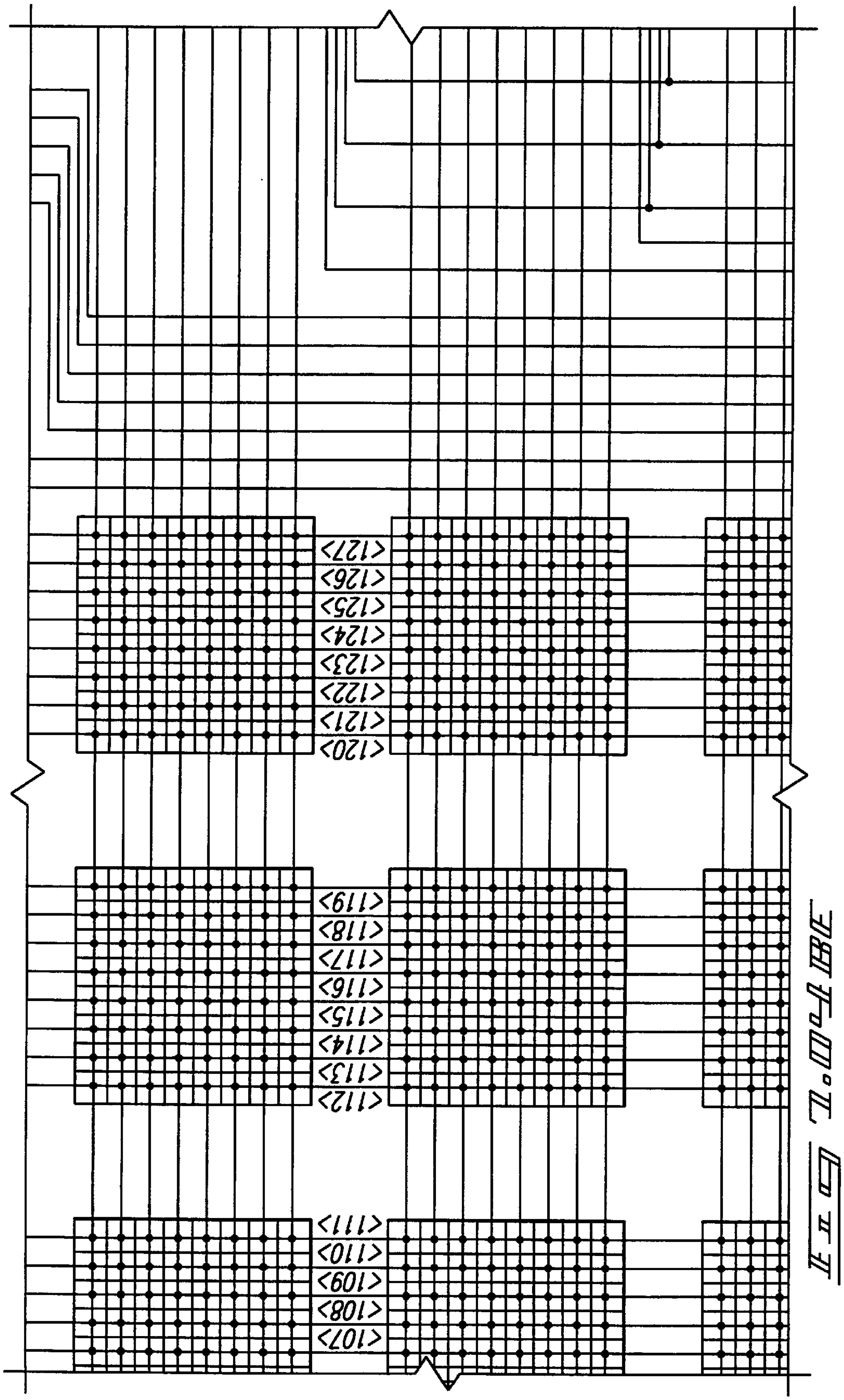
FIG. 7.04BE

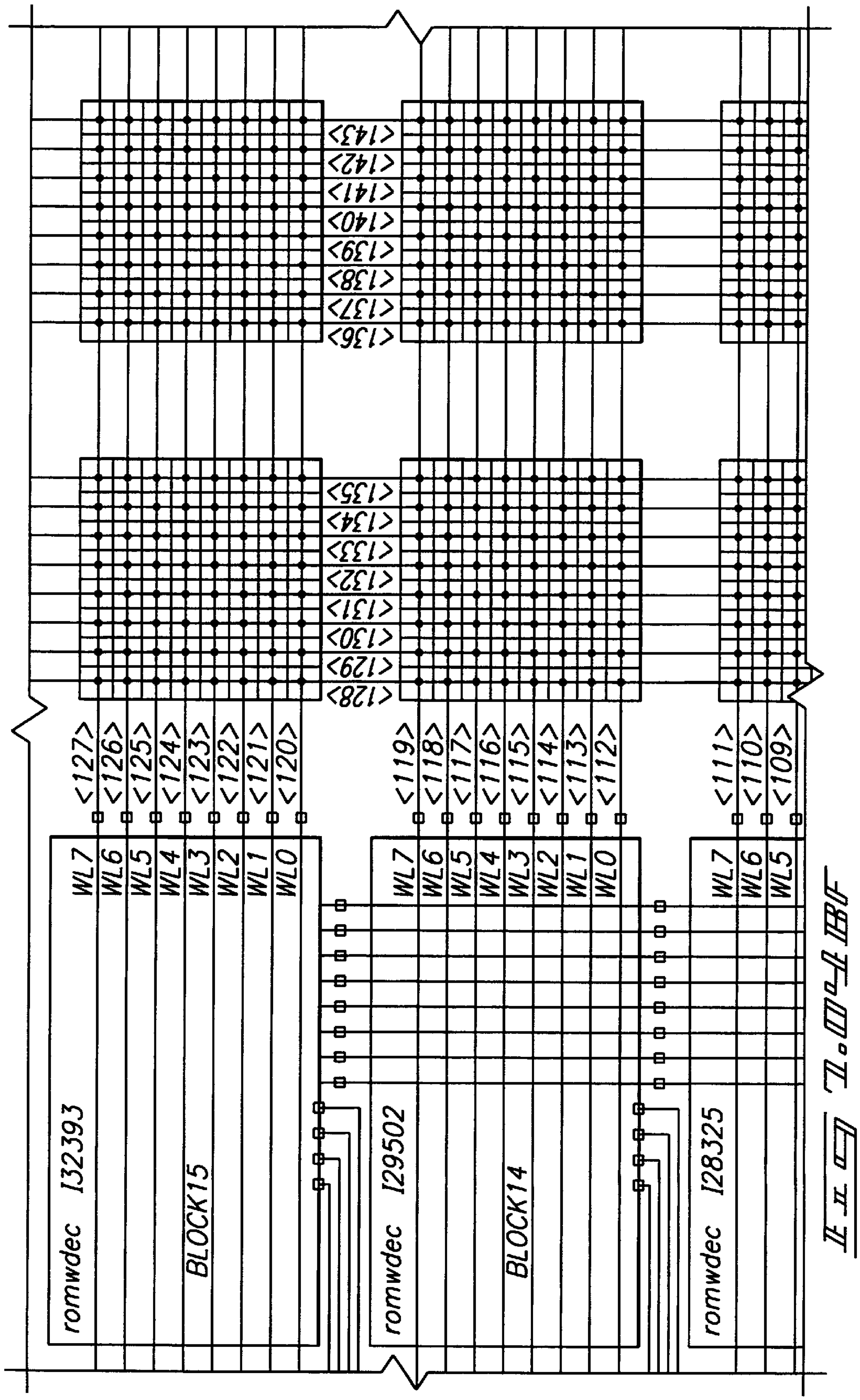
Fig. 7.04BF

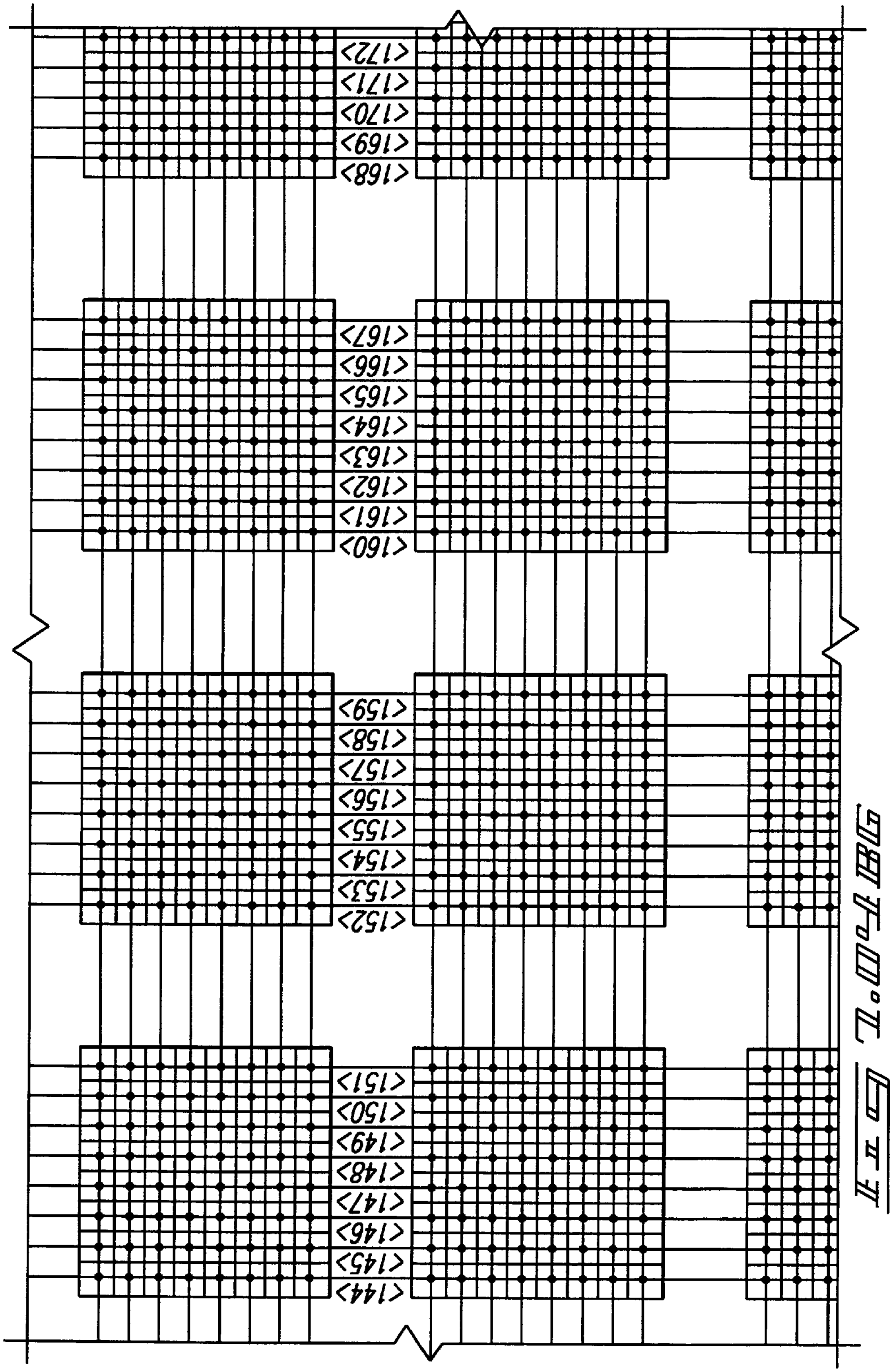
FIG. 7.04BG

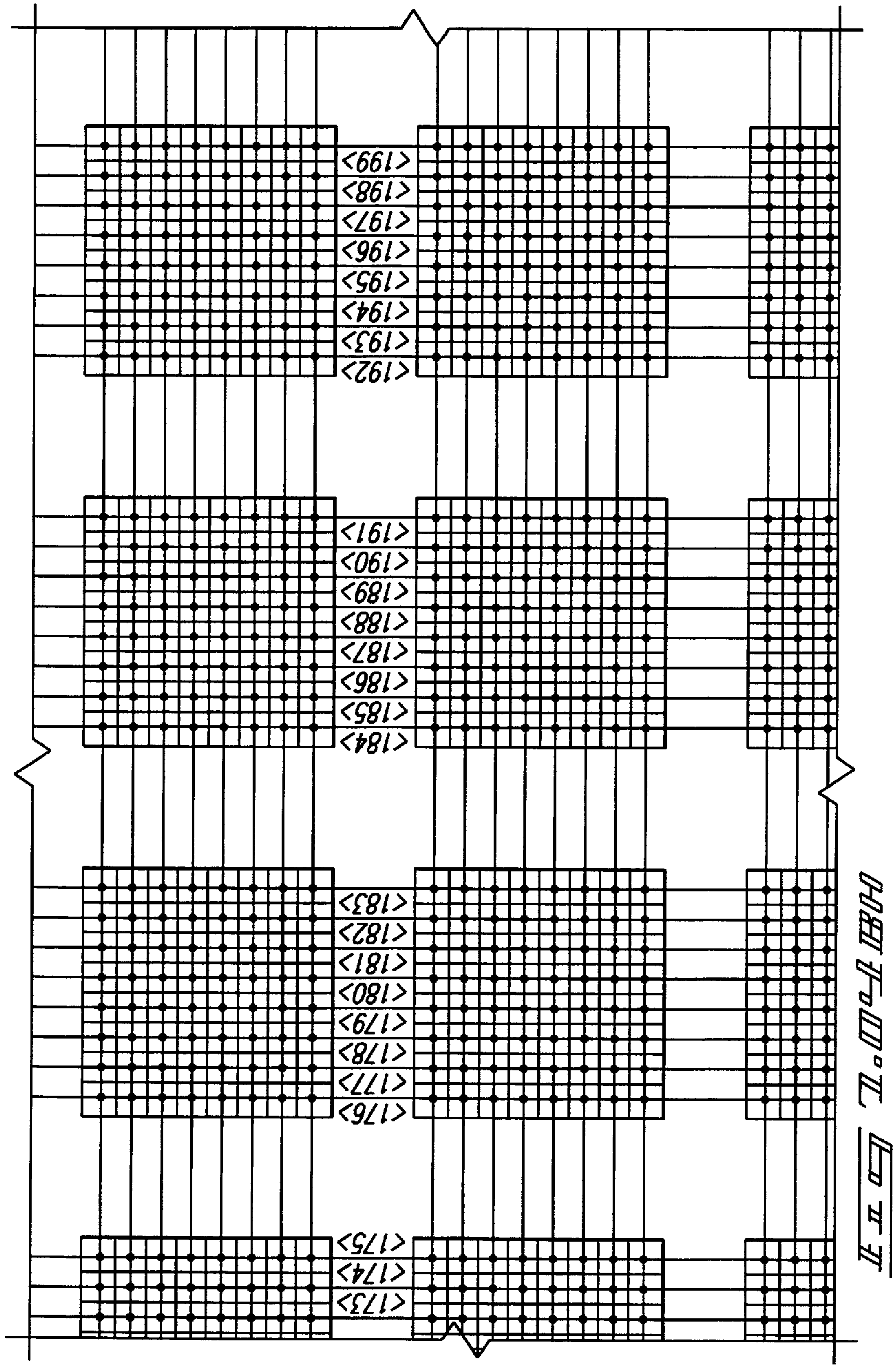
FIG. 7D4H

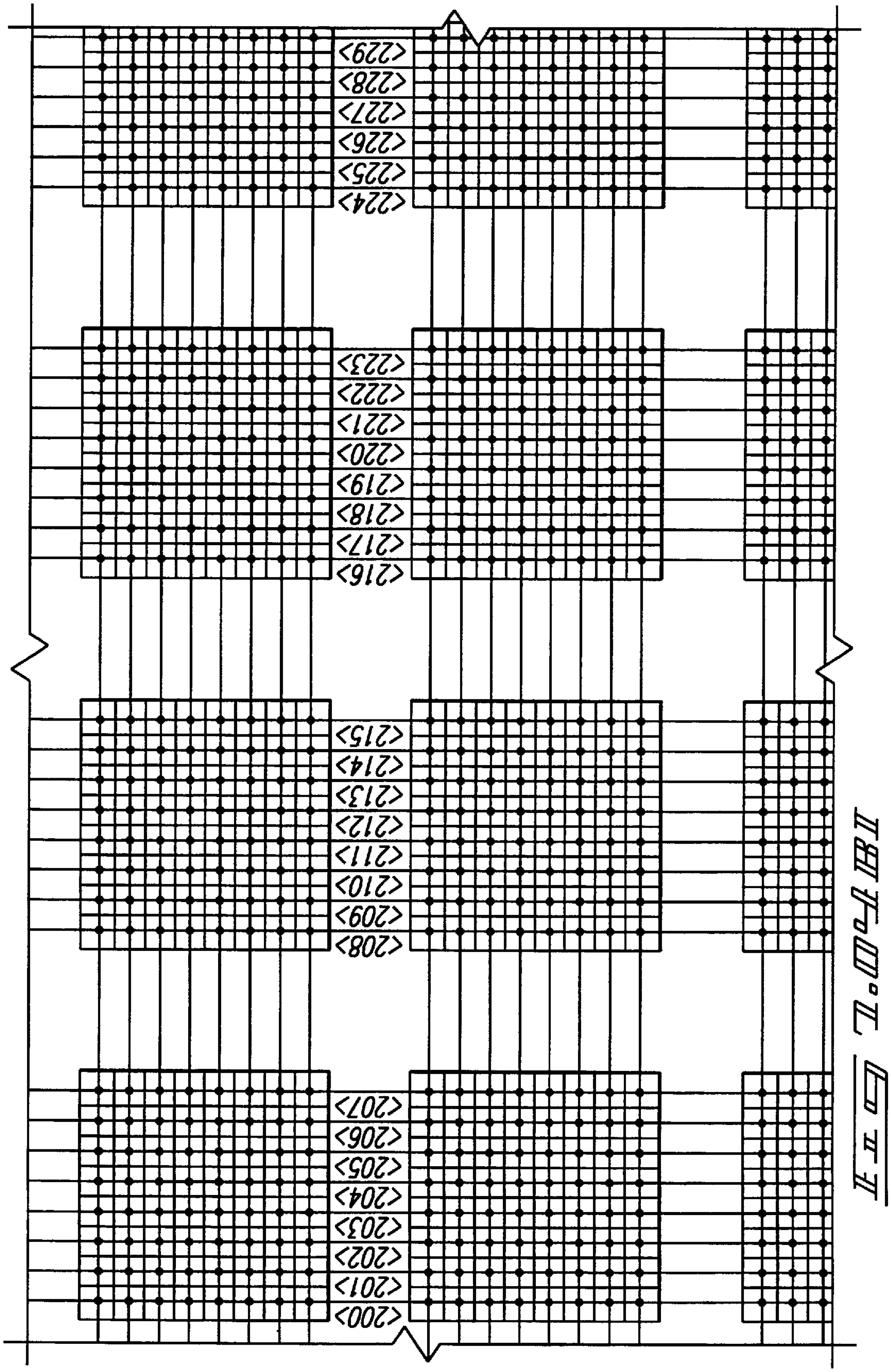
Fig. 7.04BI

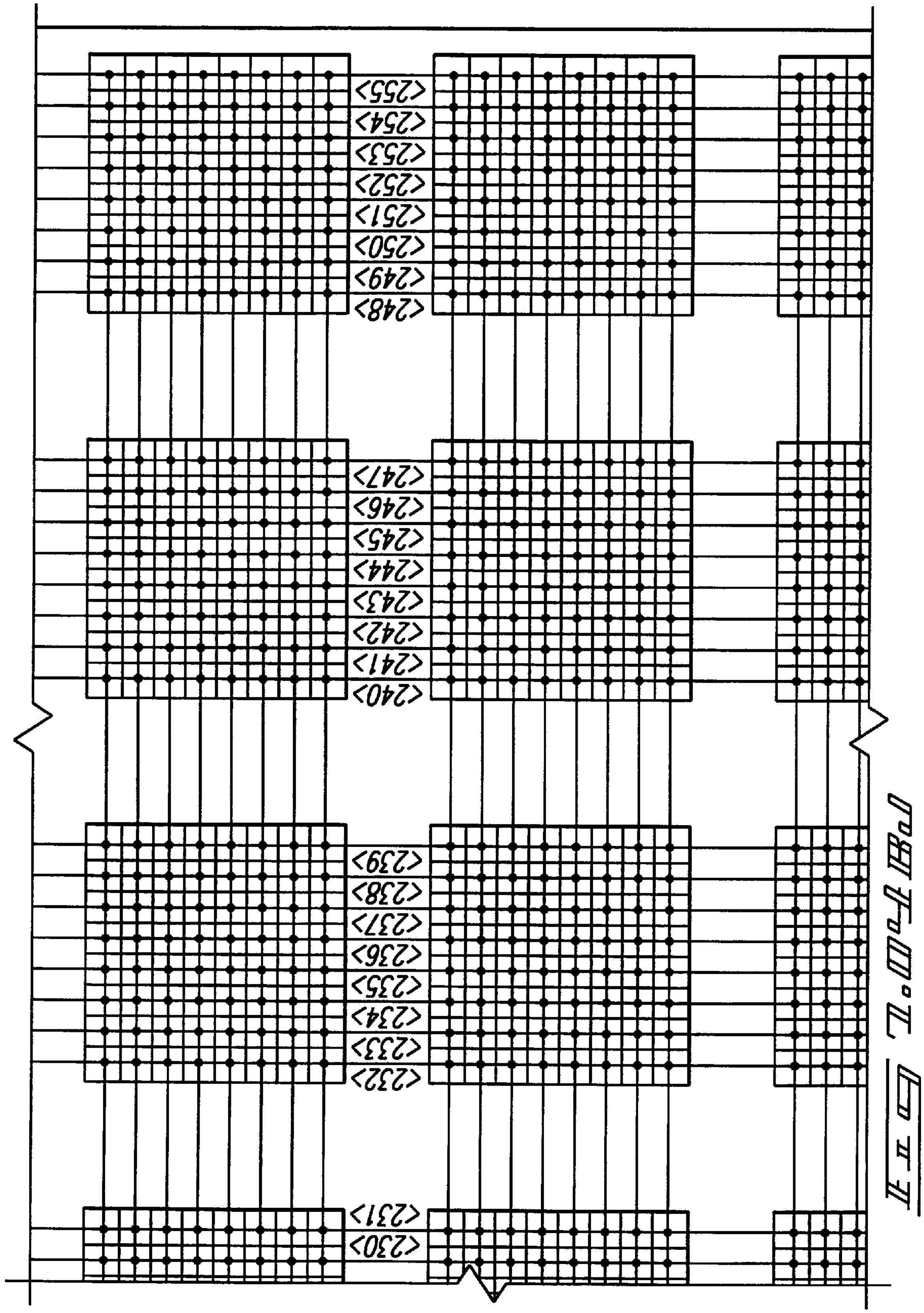
FIG. 7.04Bd

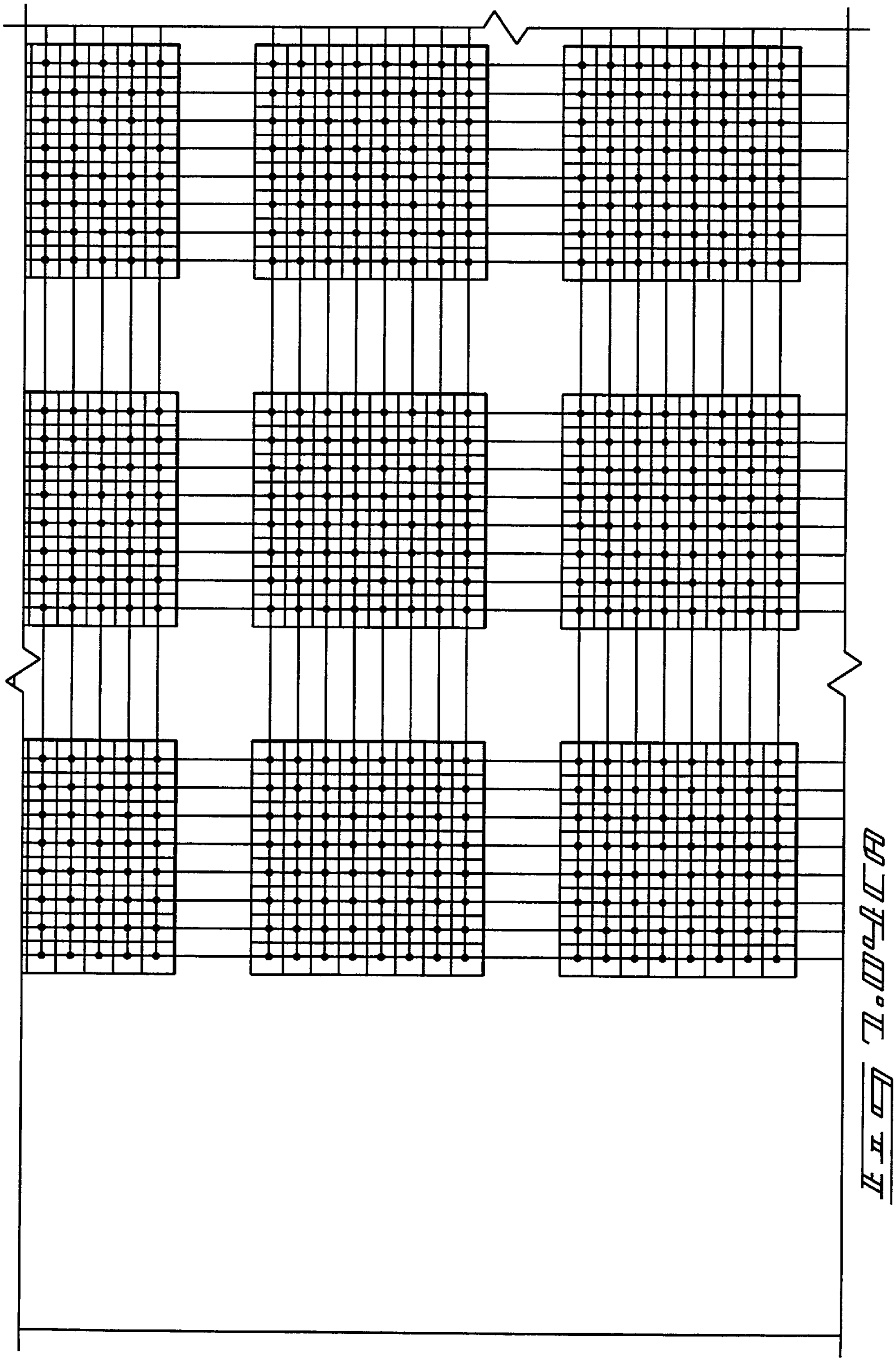
Fig. 7.04CA

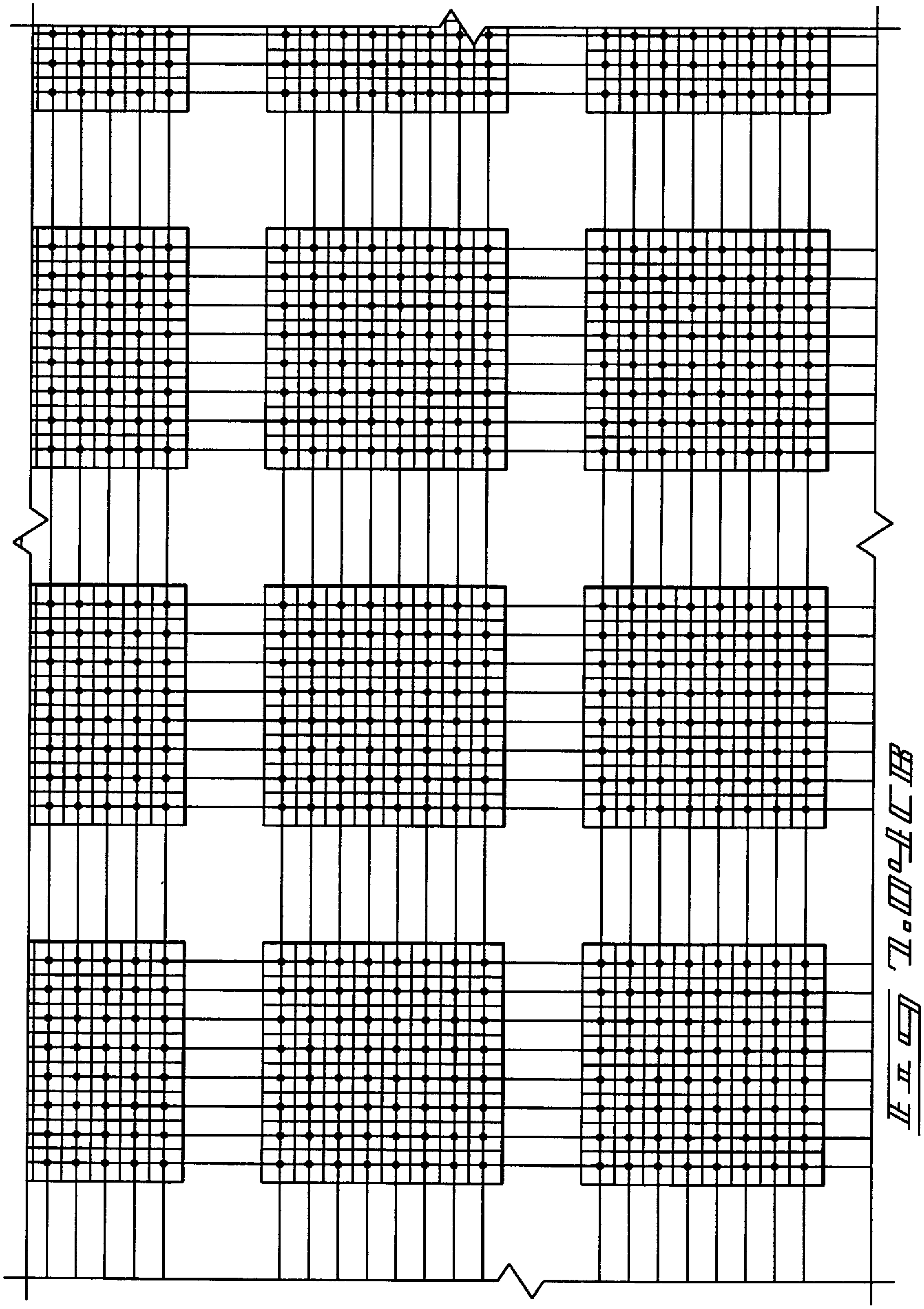
FIG. 7041B

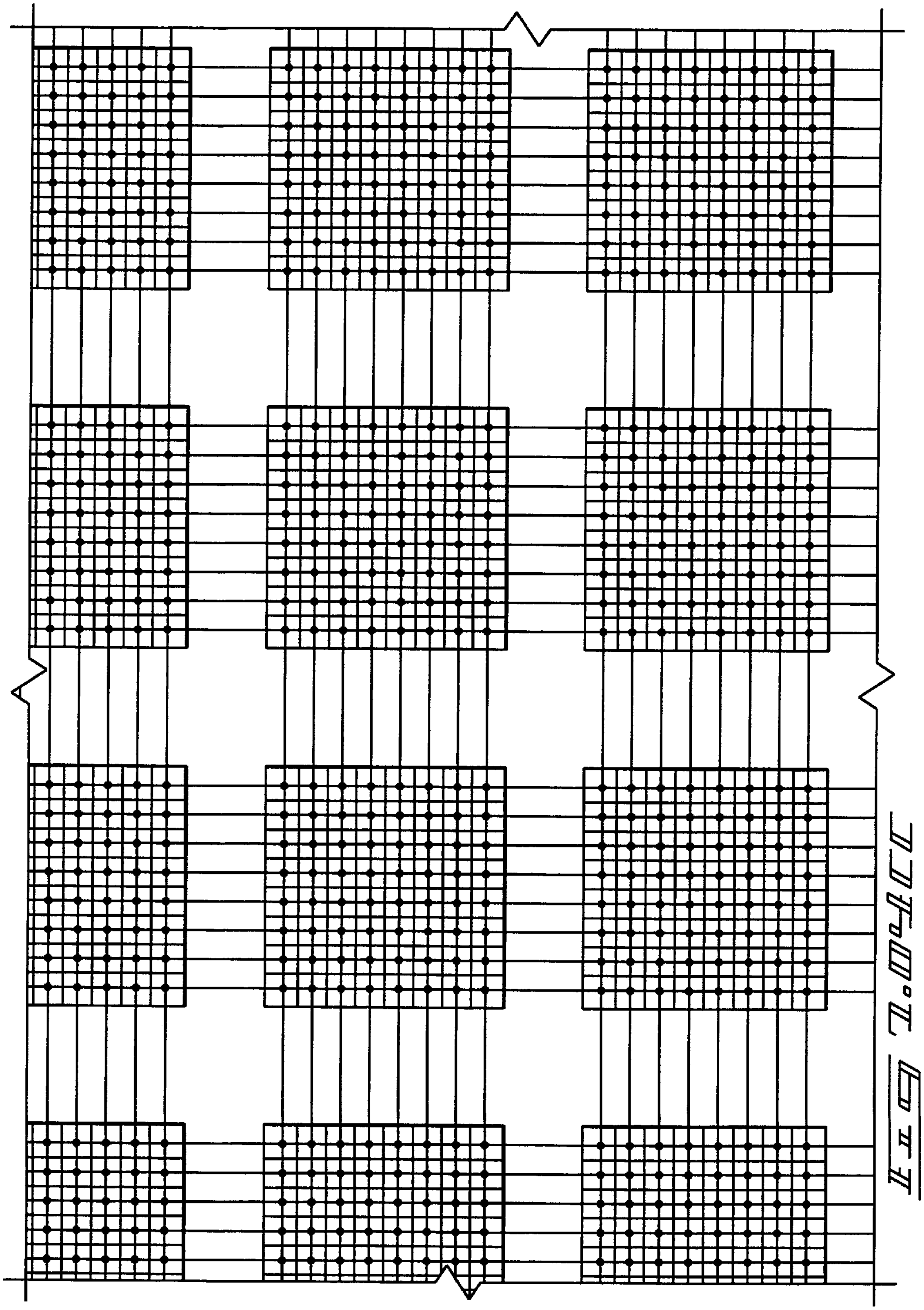
Fig. 7.04CC

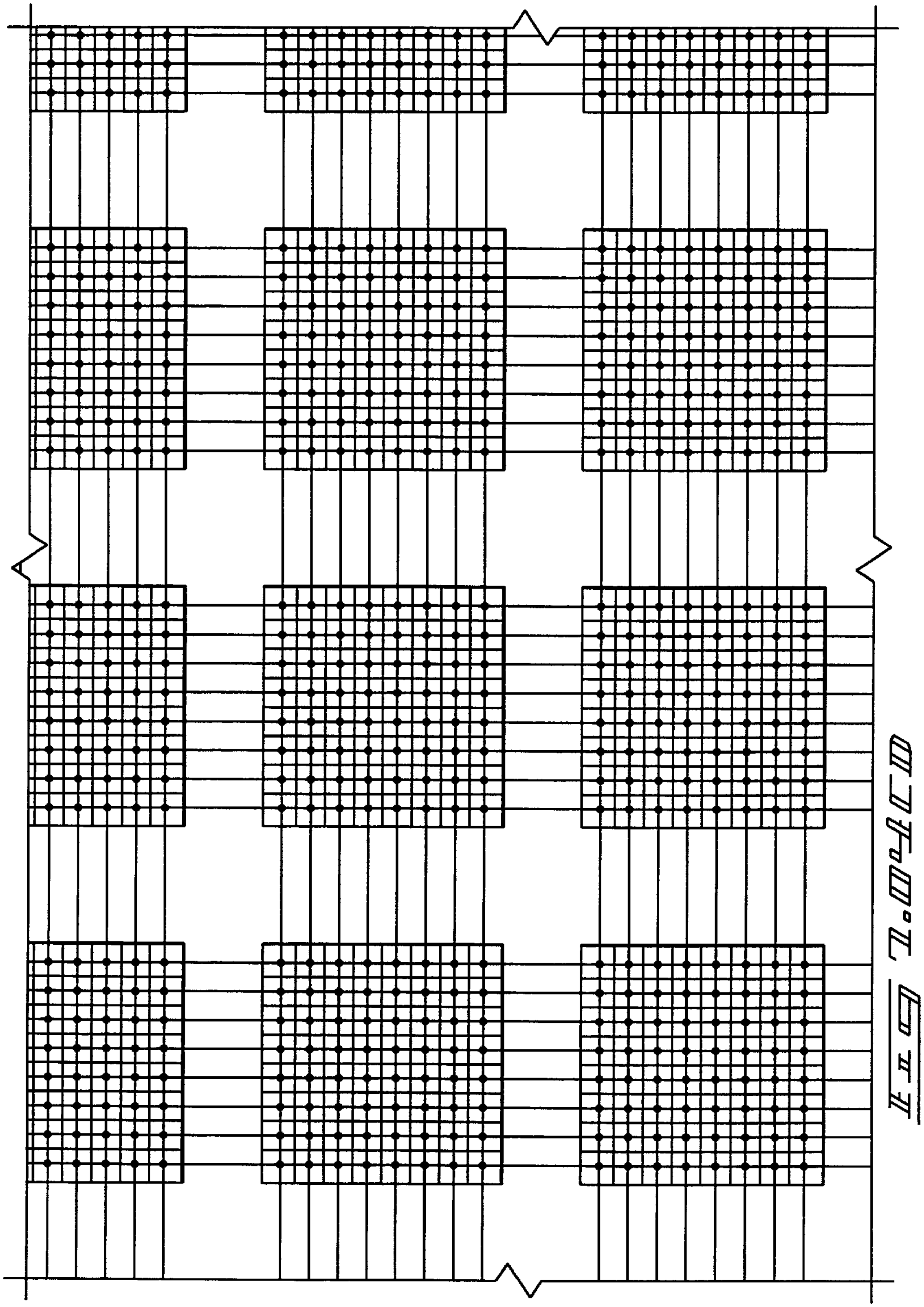
FIG. 7.84.1B

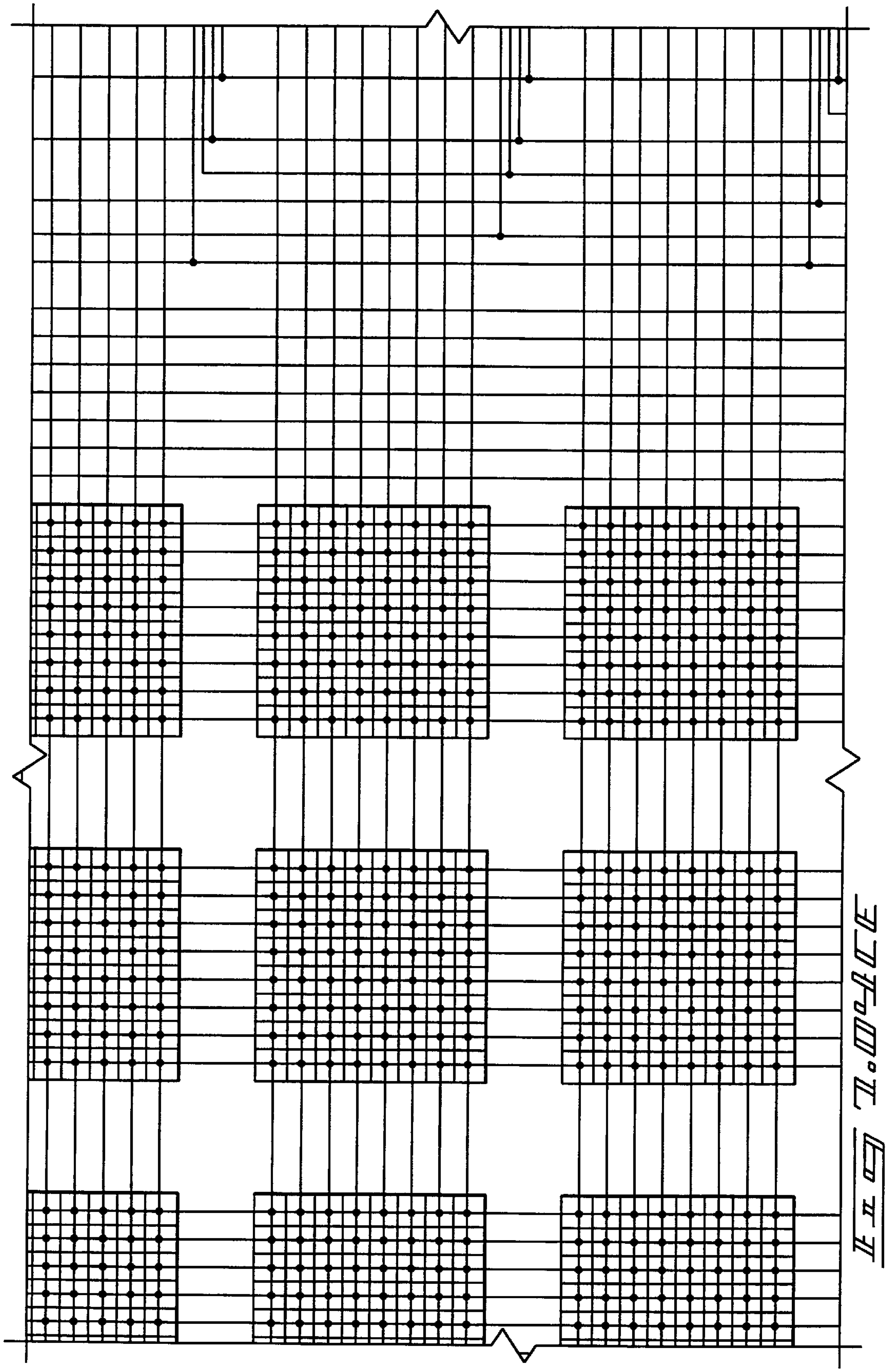
Fig. 7.04CE

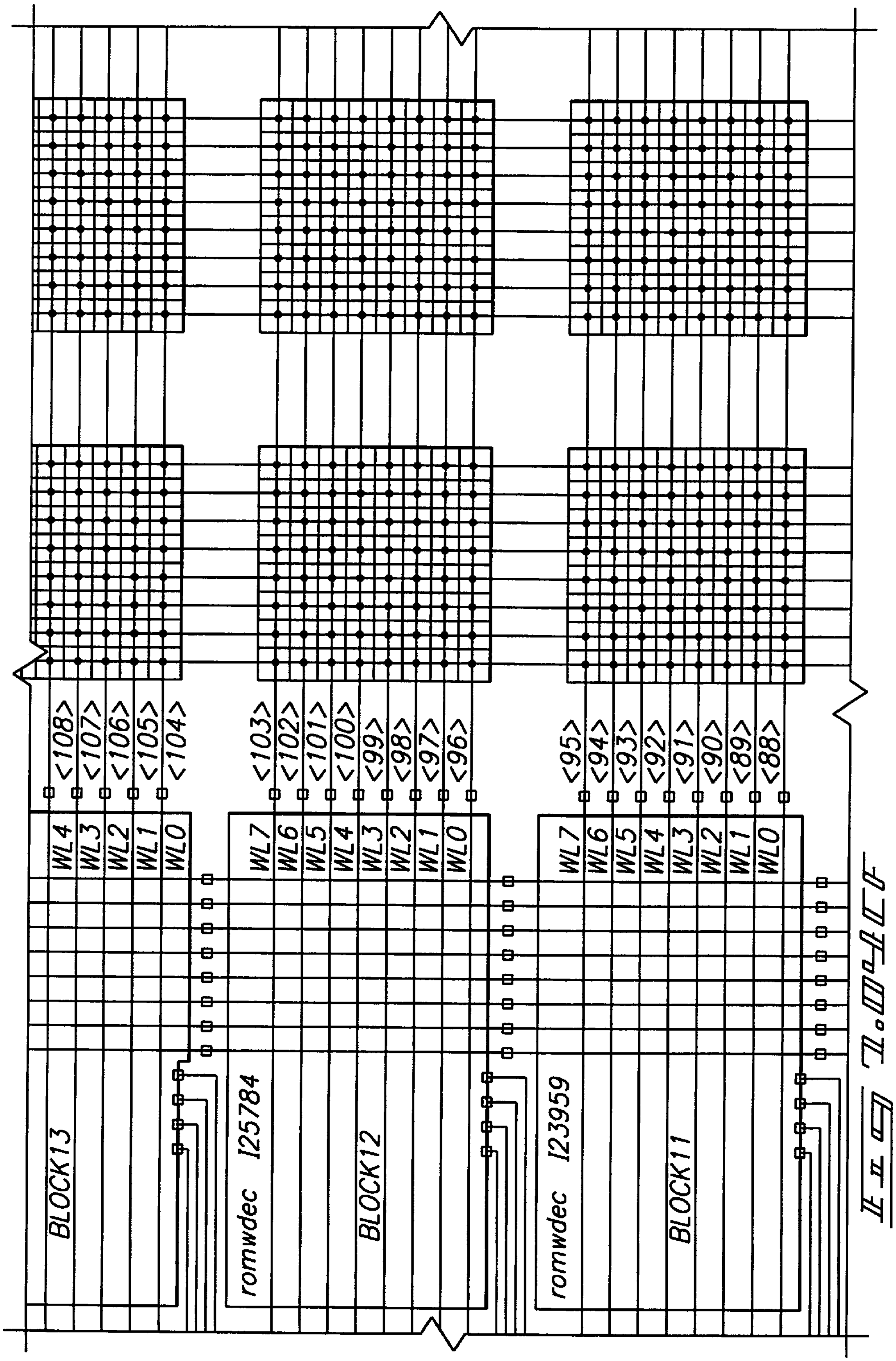
<108>
<107>
<106>
<105>
<104>
<103>
<102>
<101>
<100>
<99>
<98>
<97>
<96>
<95>
<94>
<93>
<92>
<91>
<90>
<89>
<88>
WL4 WL3 WL2 WL1 WL0
WL7 WL6 WL5 WL4 WL3 WL2 WL1 WL0
WL7 WL6 WL5 WL4 WL3 WL2 WL1 WL0
BLOCK13
romwdec I25784
BLOCK12
romwdec I23959
BLOCK11

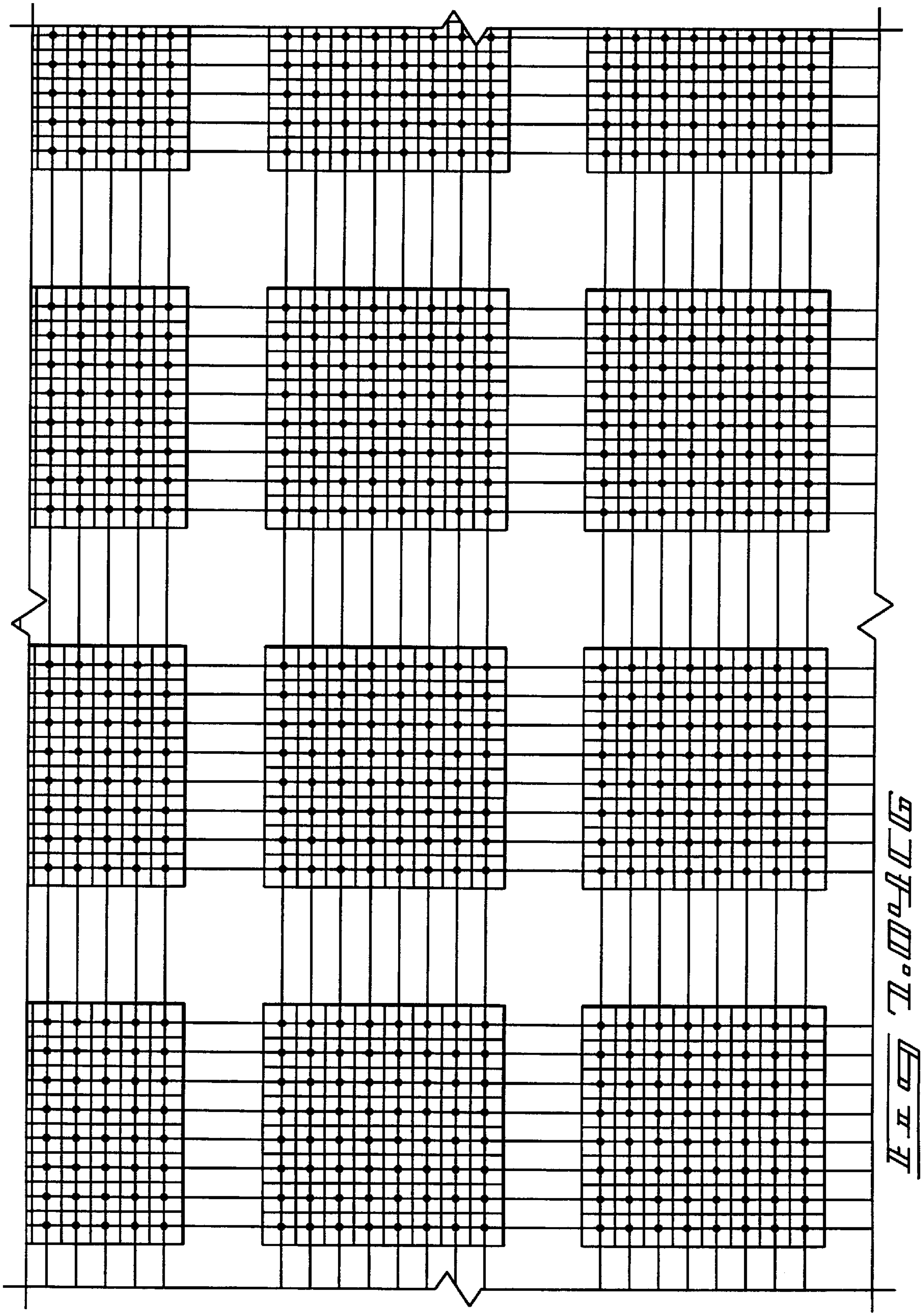
Fig. 7.04G

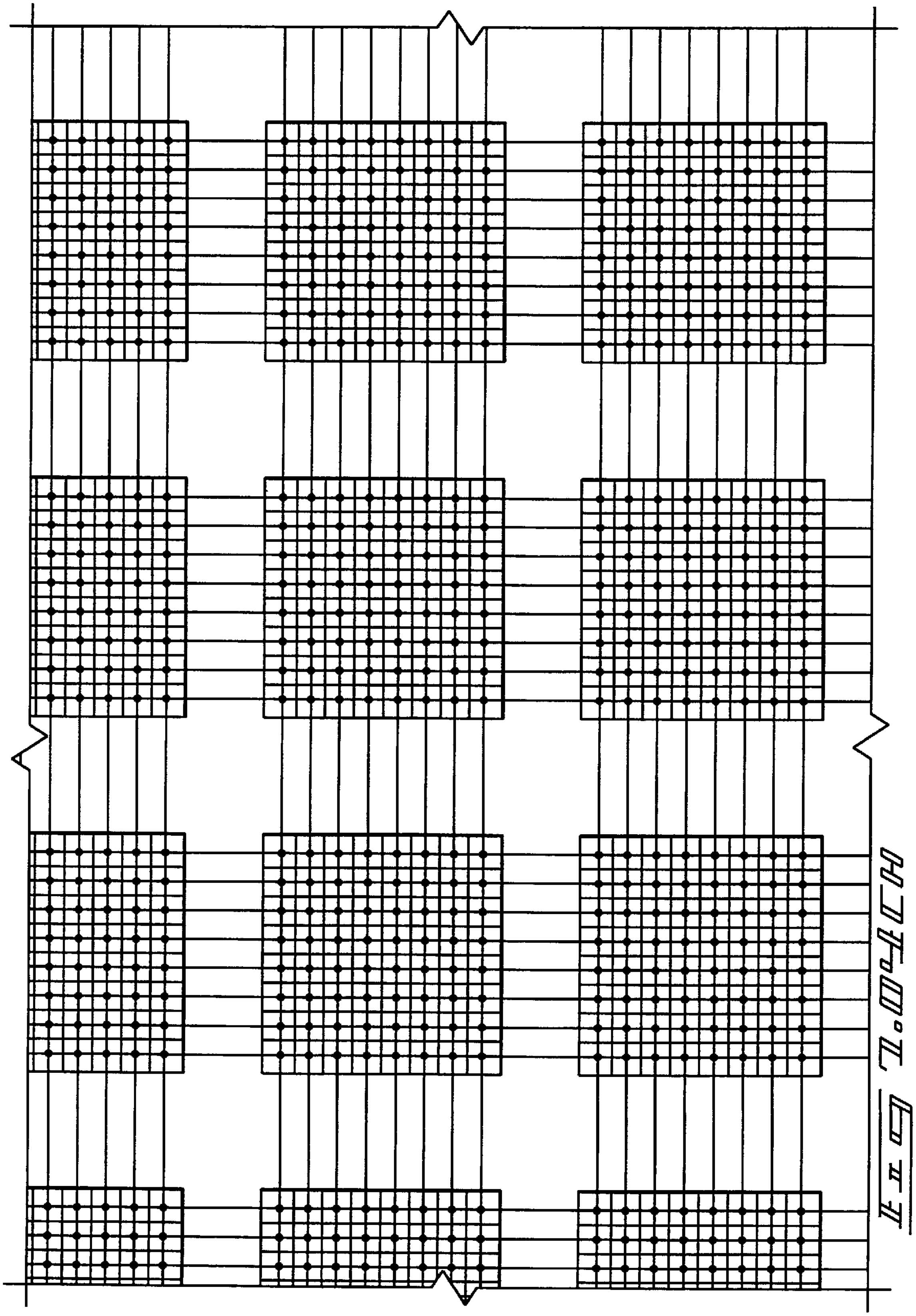
Fig. 7.04H

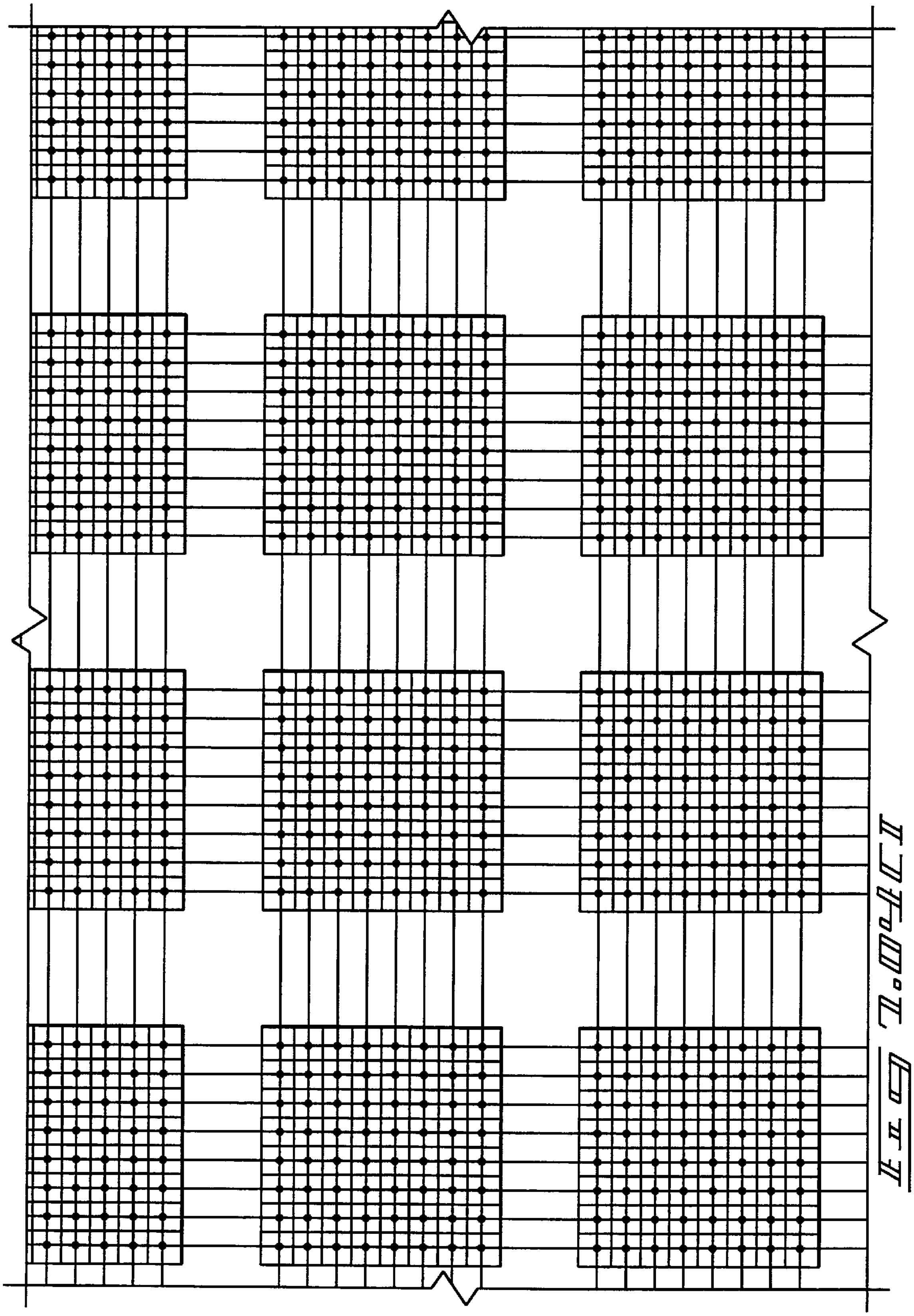
Fig. 7.04CI

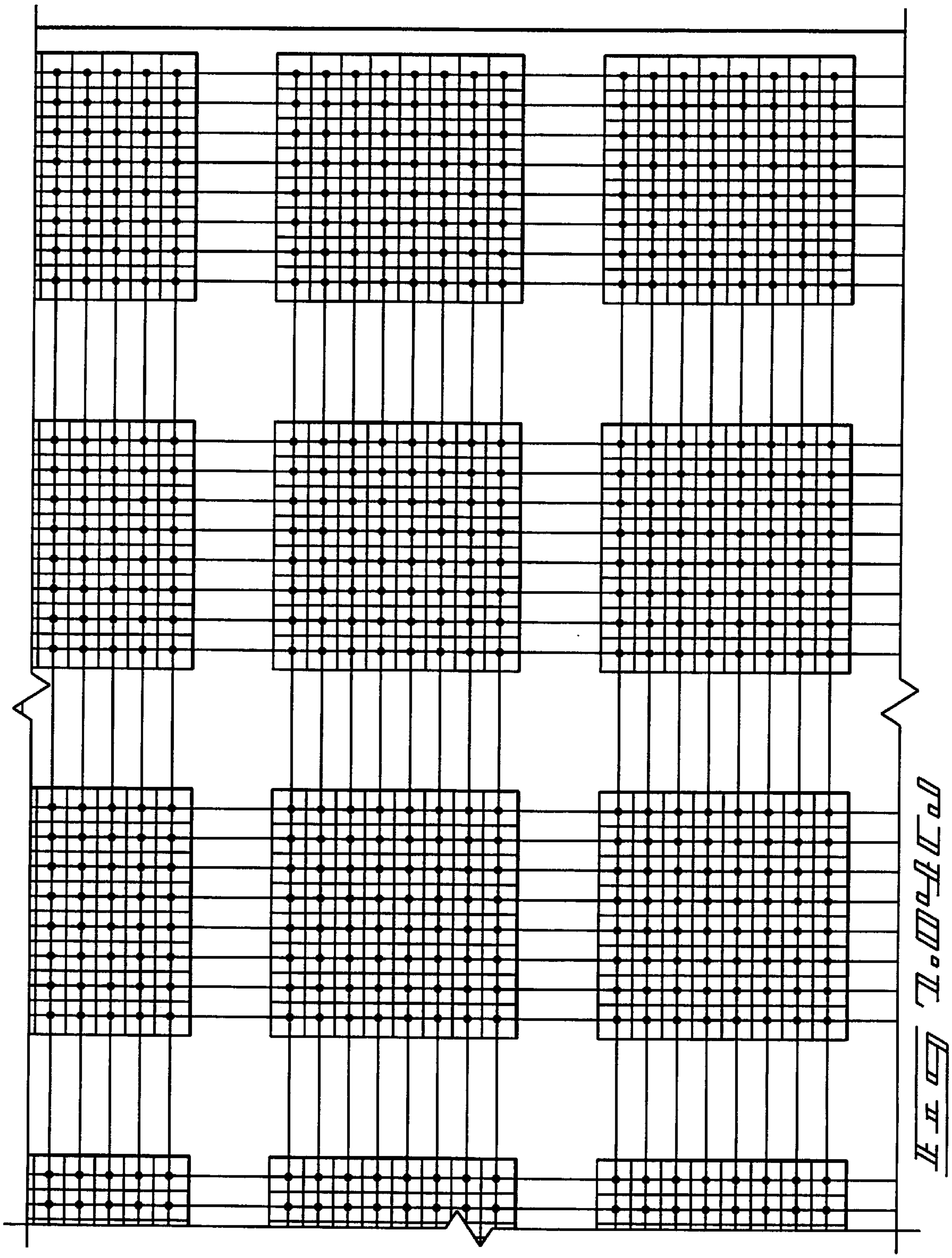
Fig. 7.04d

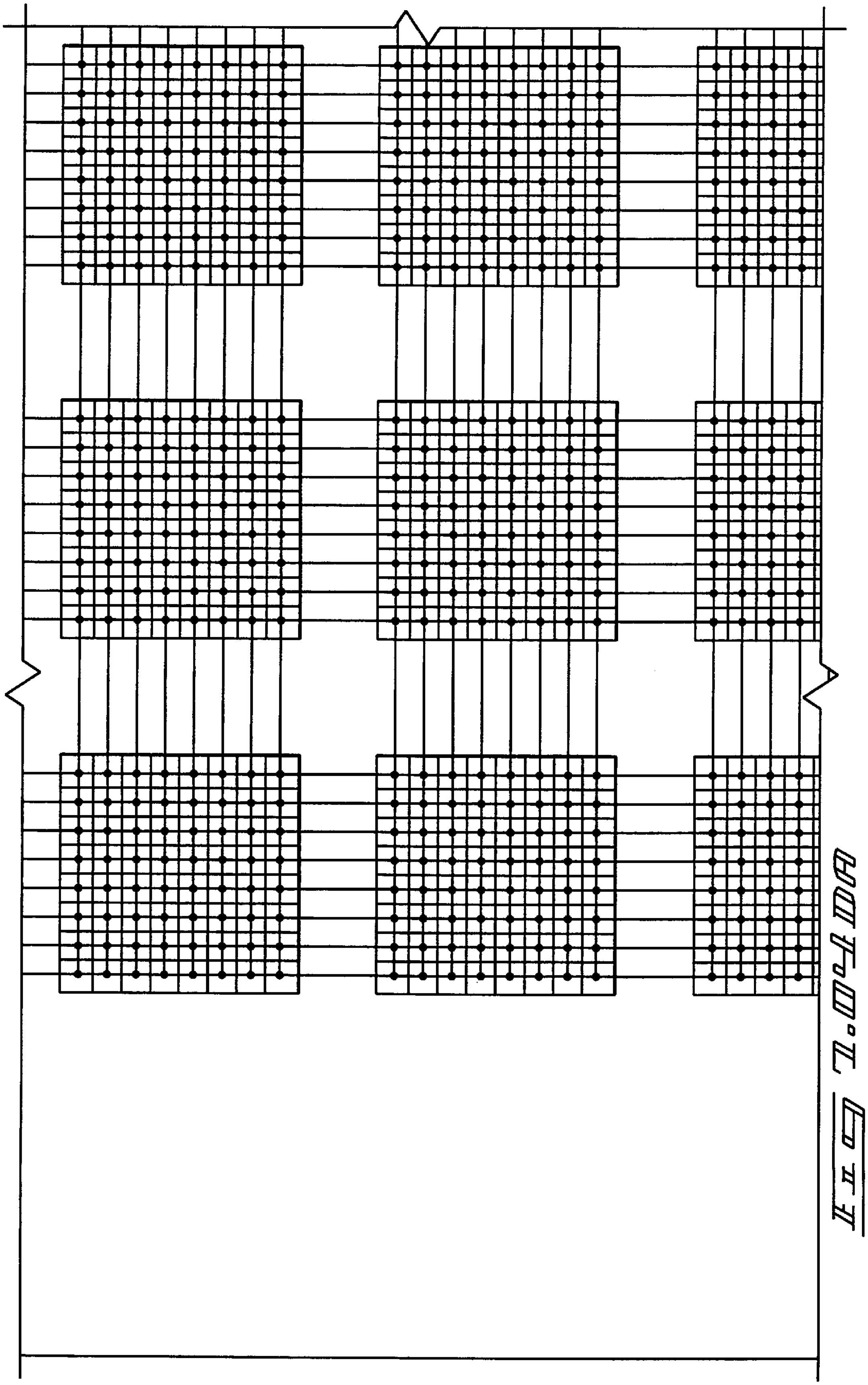
FIG. 7.04B

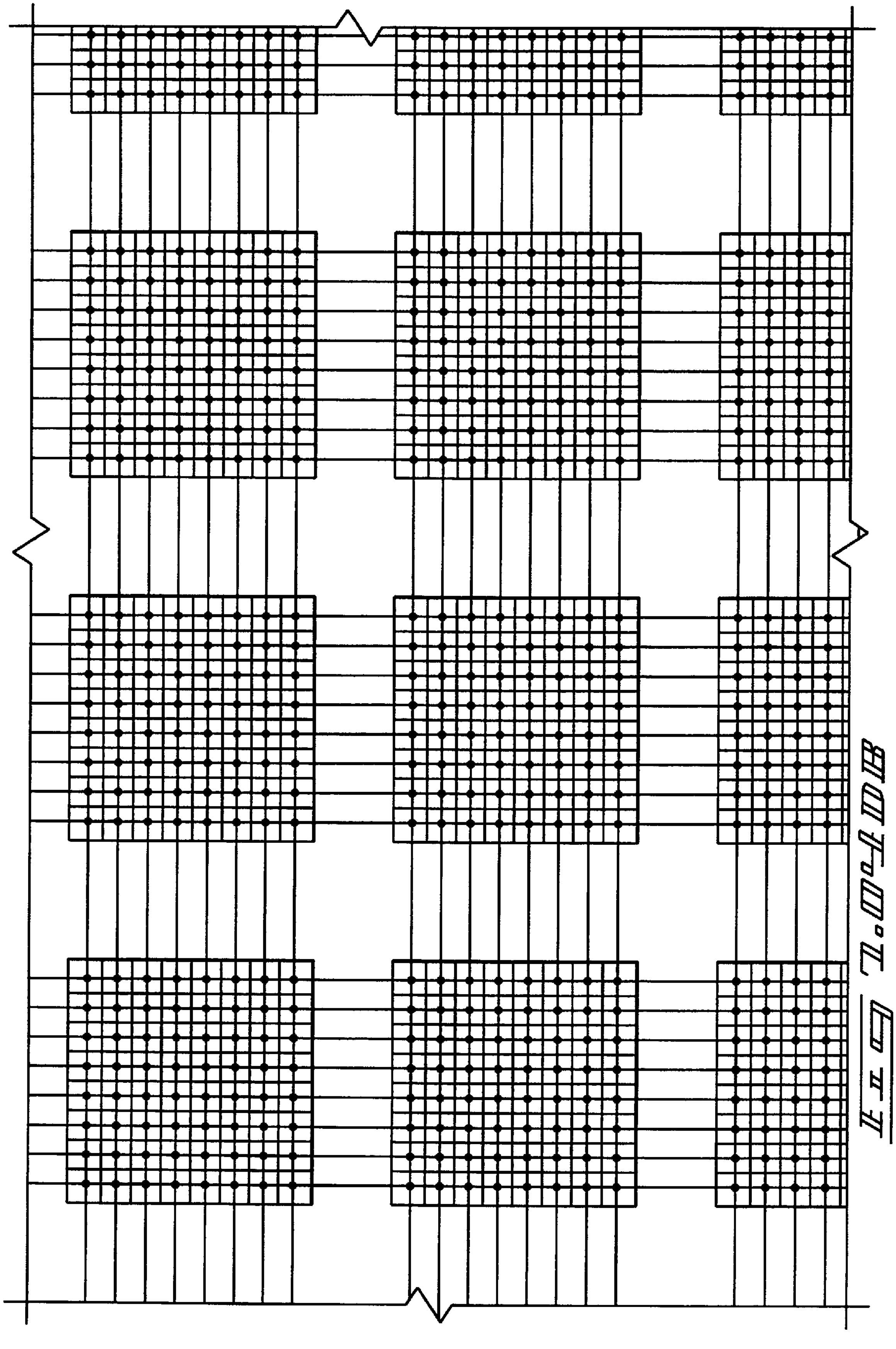
FIG. 7.0F0B

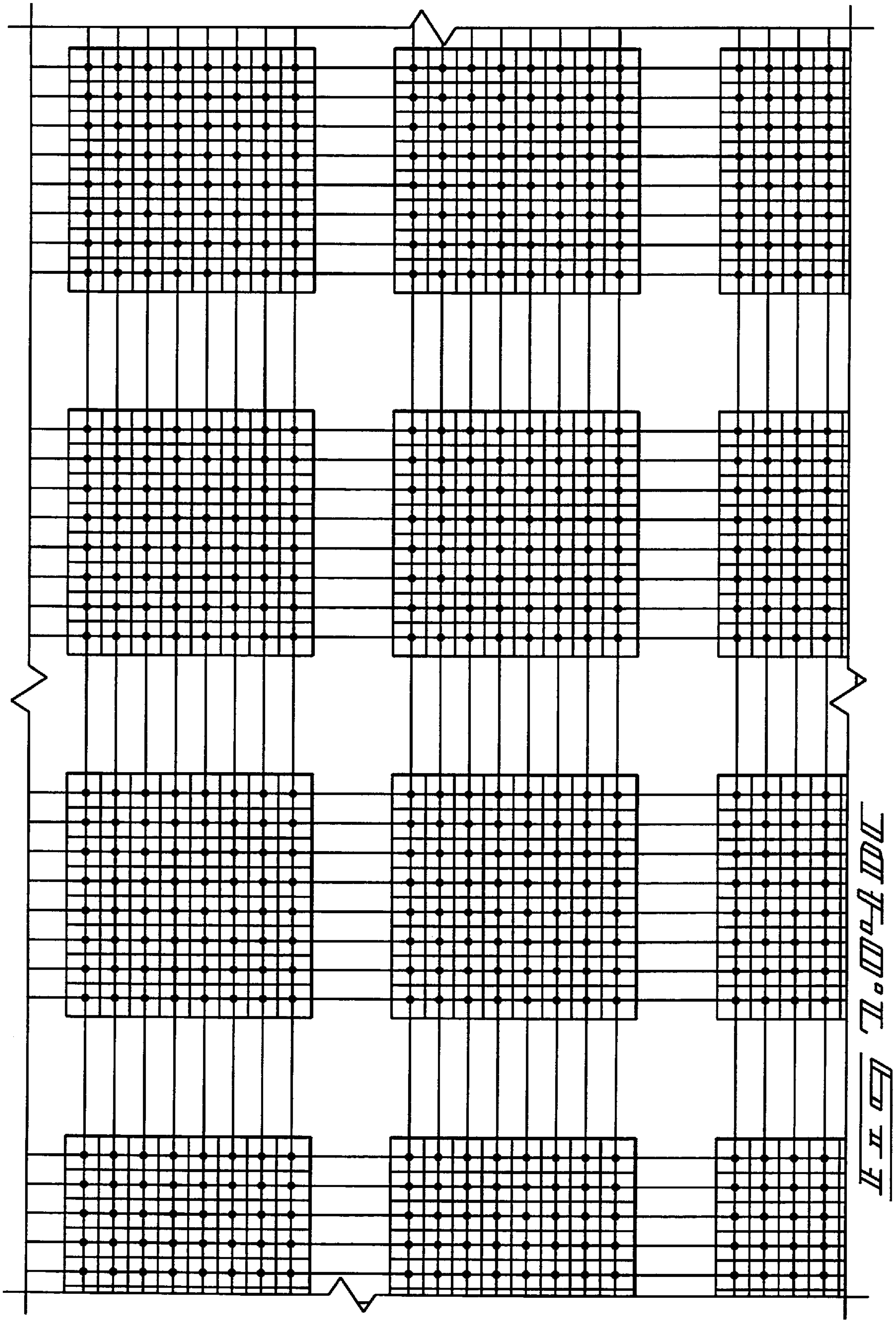
FIG. 7.04DE

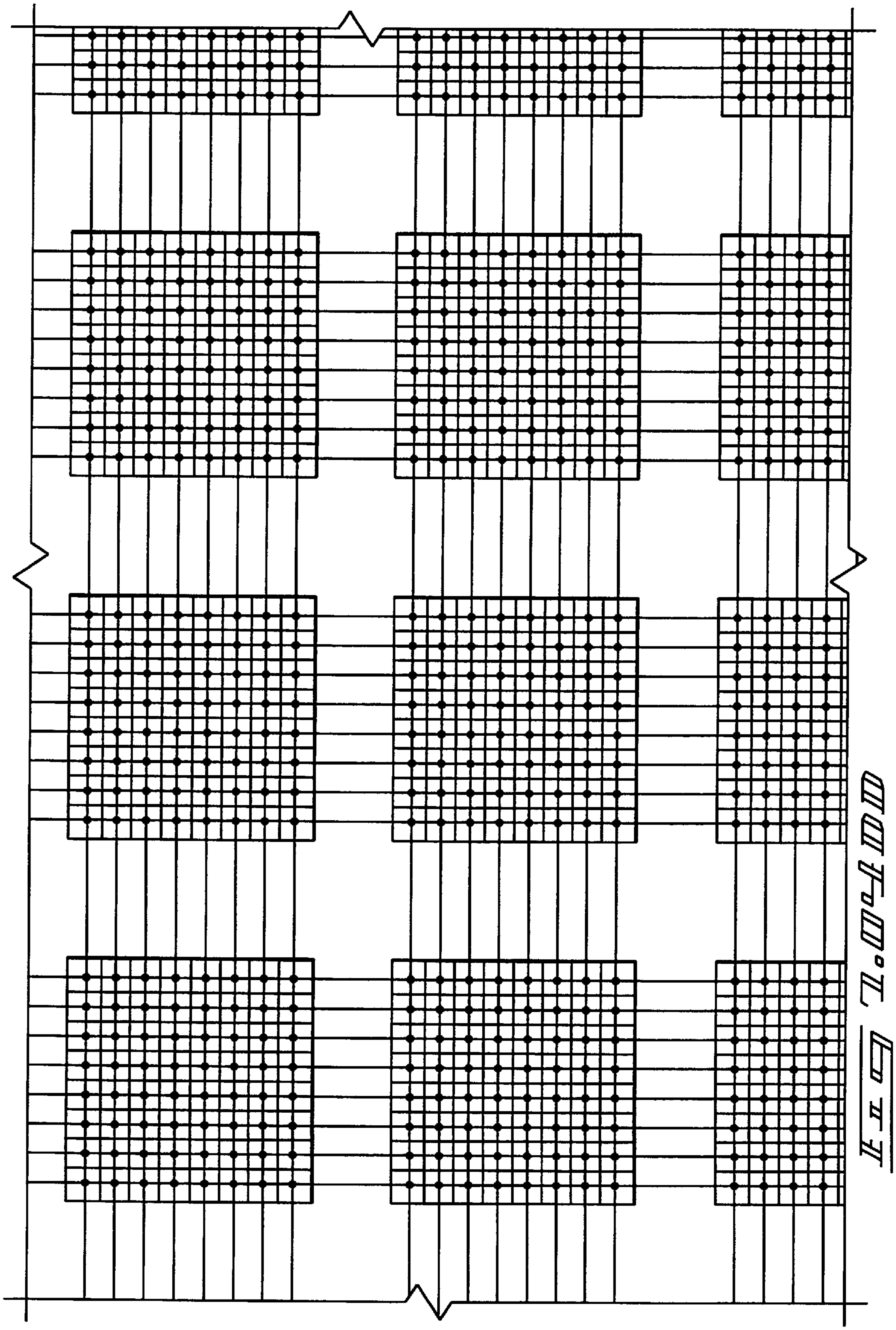
Fig. 7.04DD

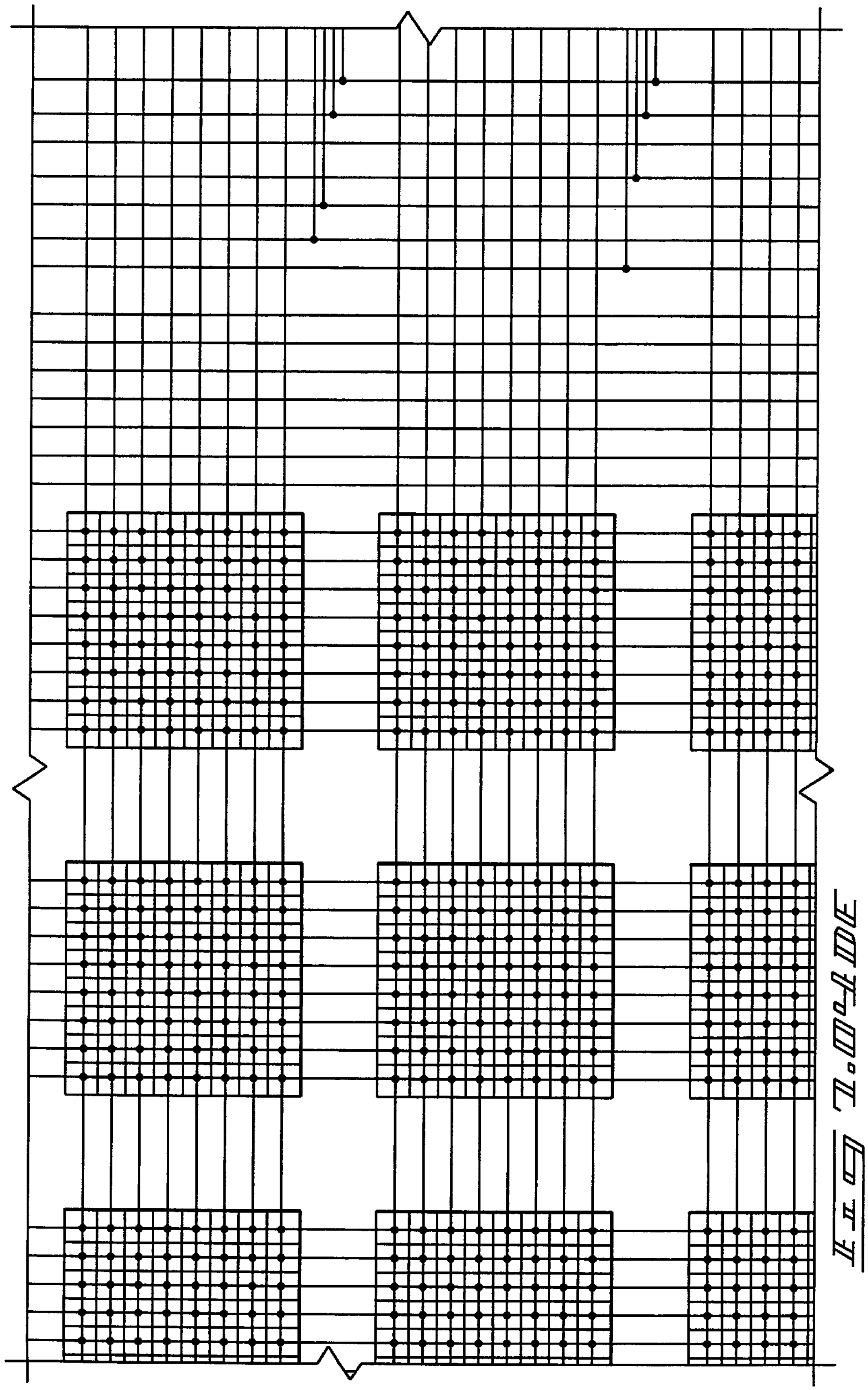
FIG. 7.04DE

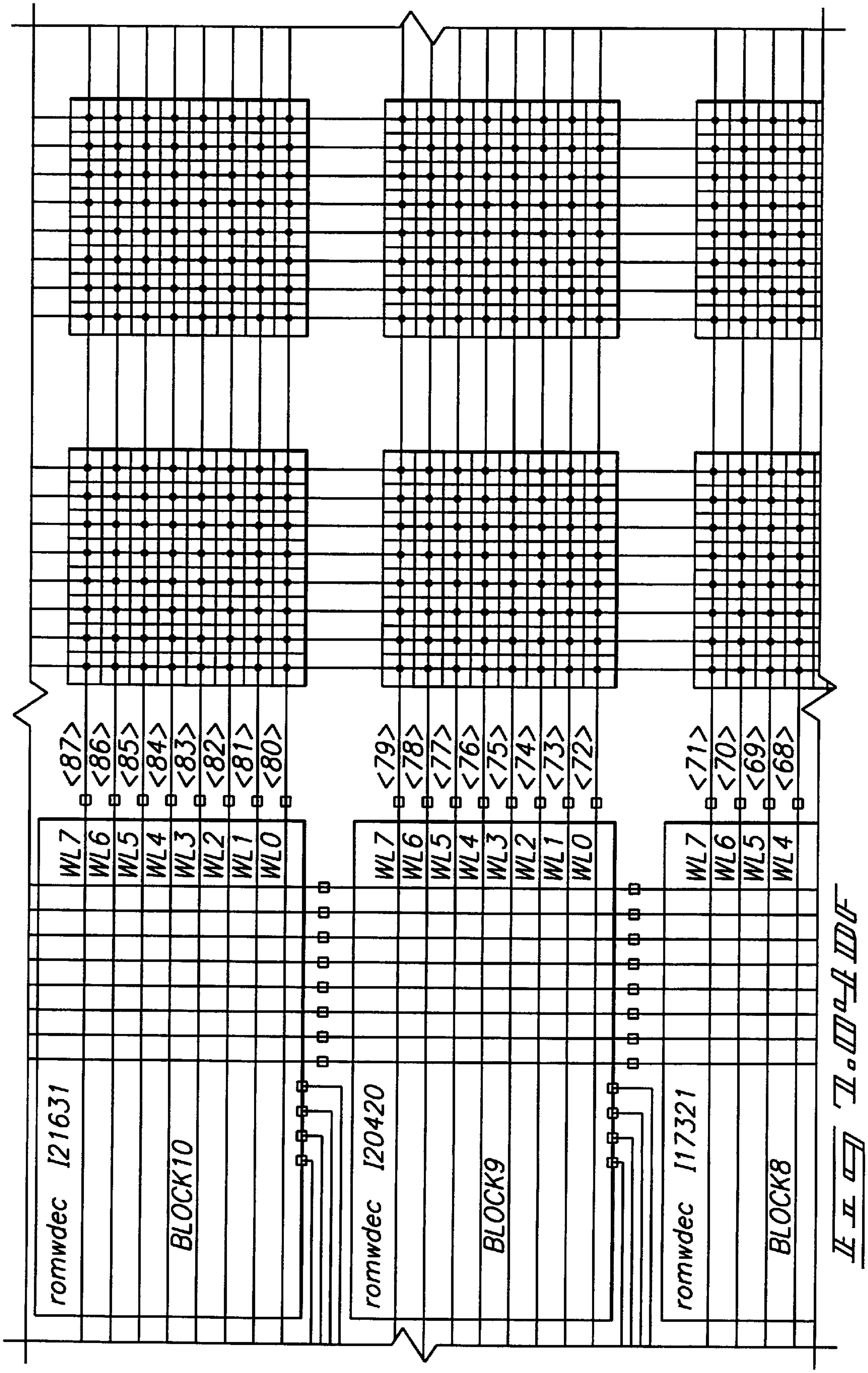
FIG. 7.04DF

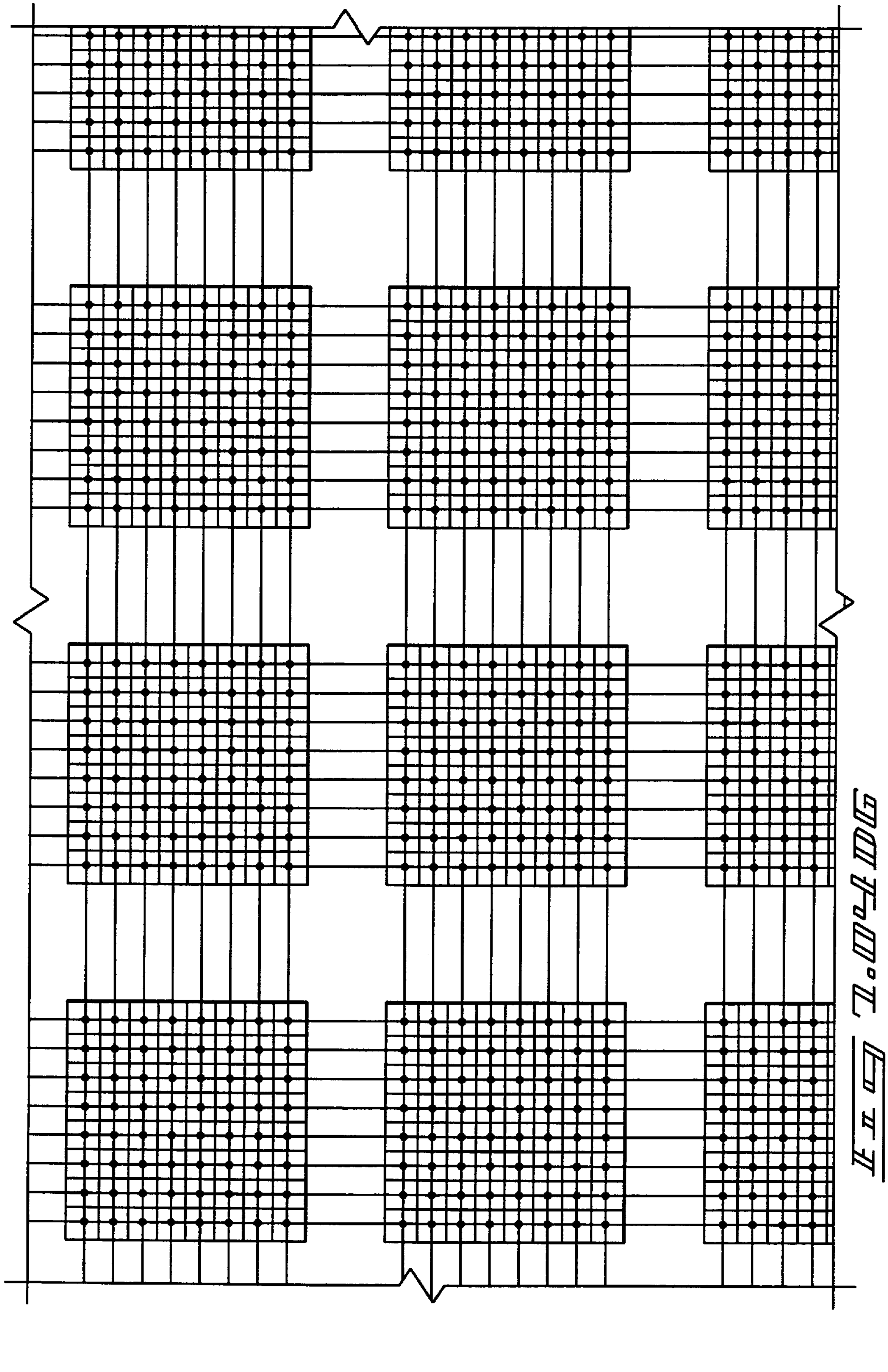
Fig. 7.04G

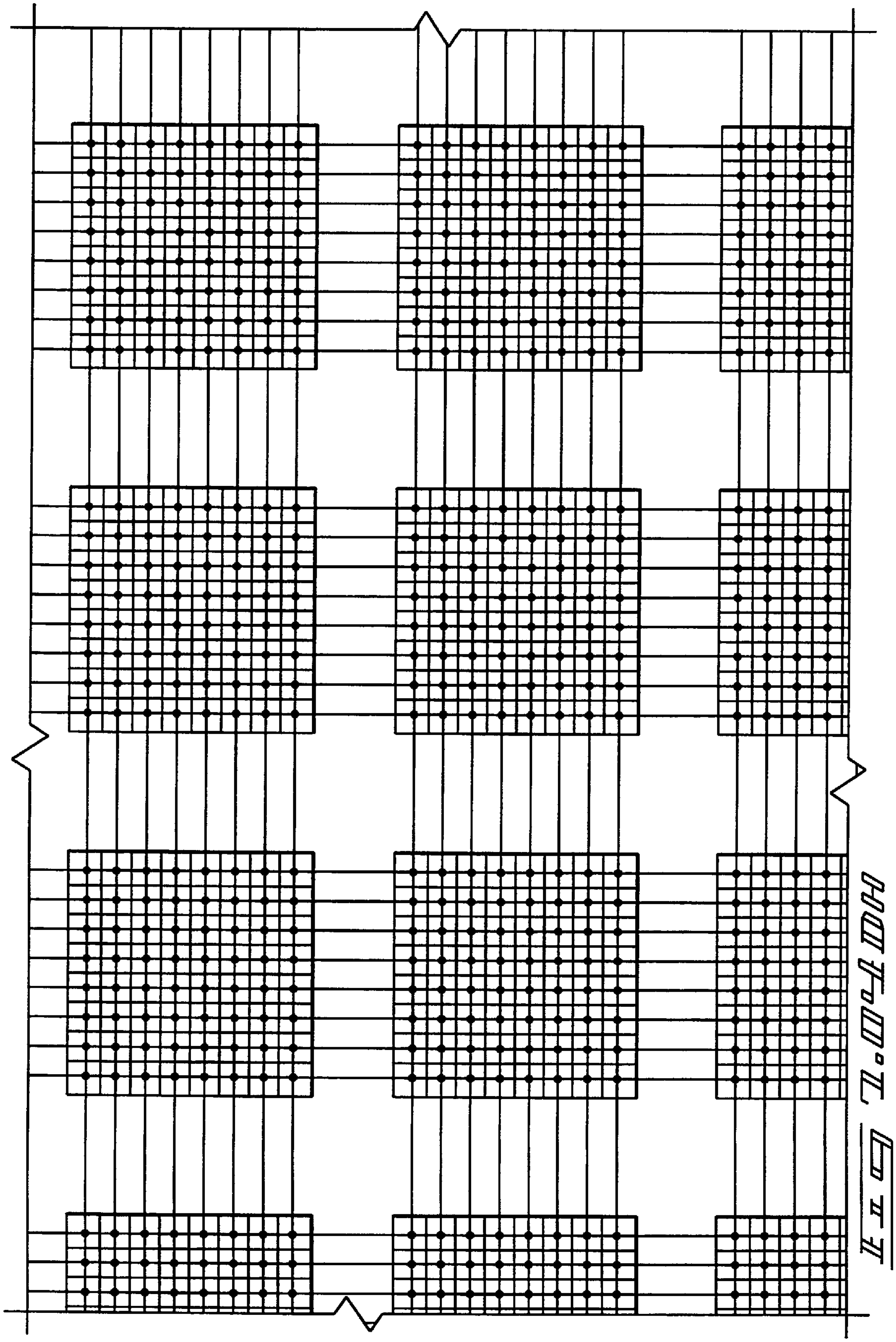
FIG. 7.0A

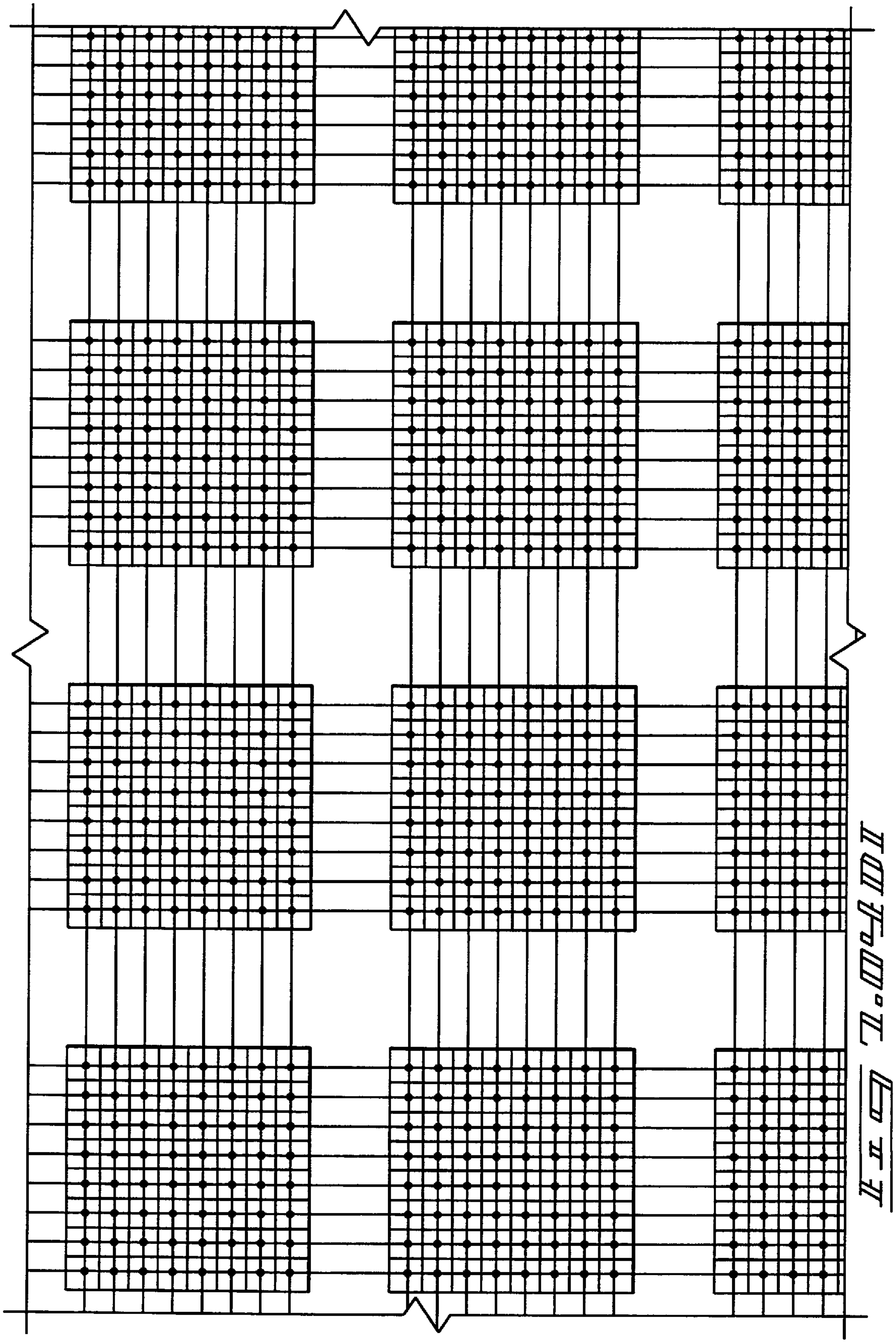
Fig. 7.04DI

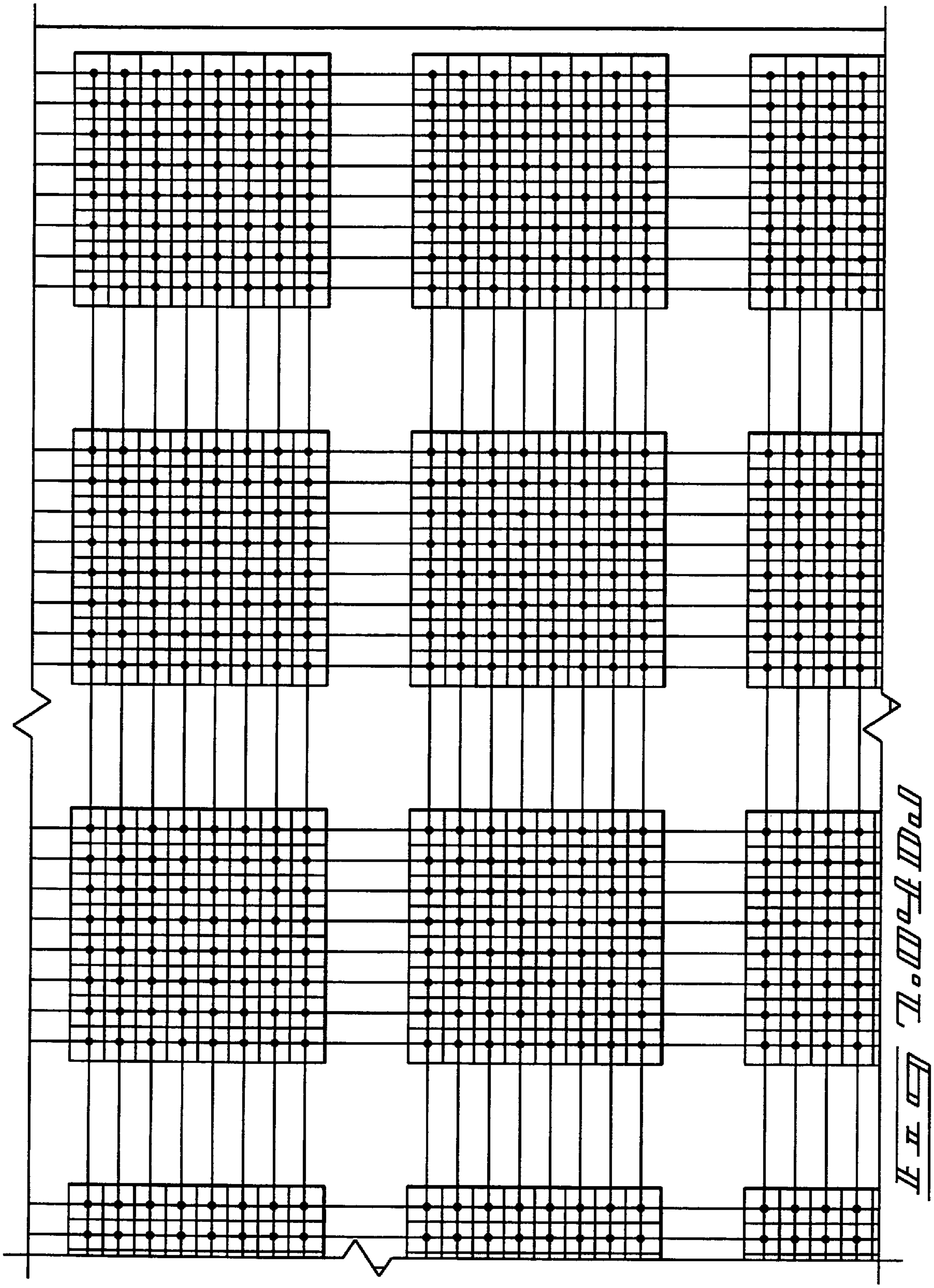
FIG. 7.040d

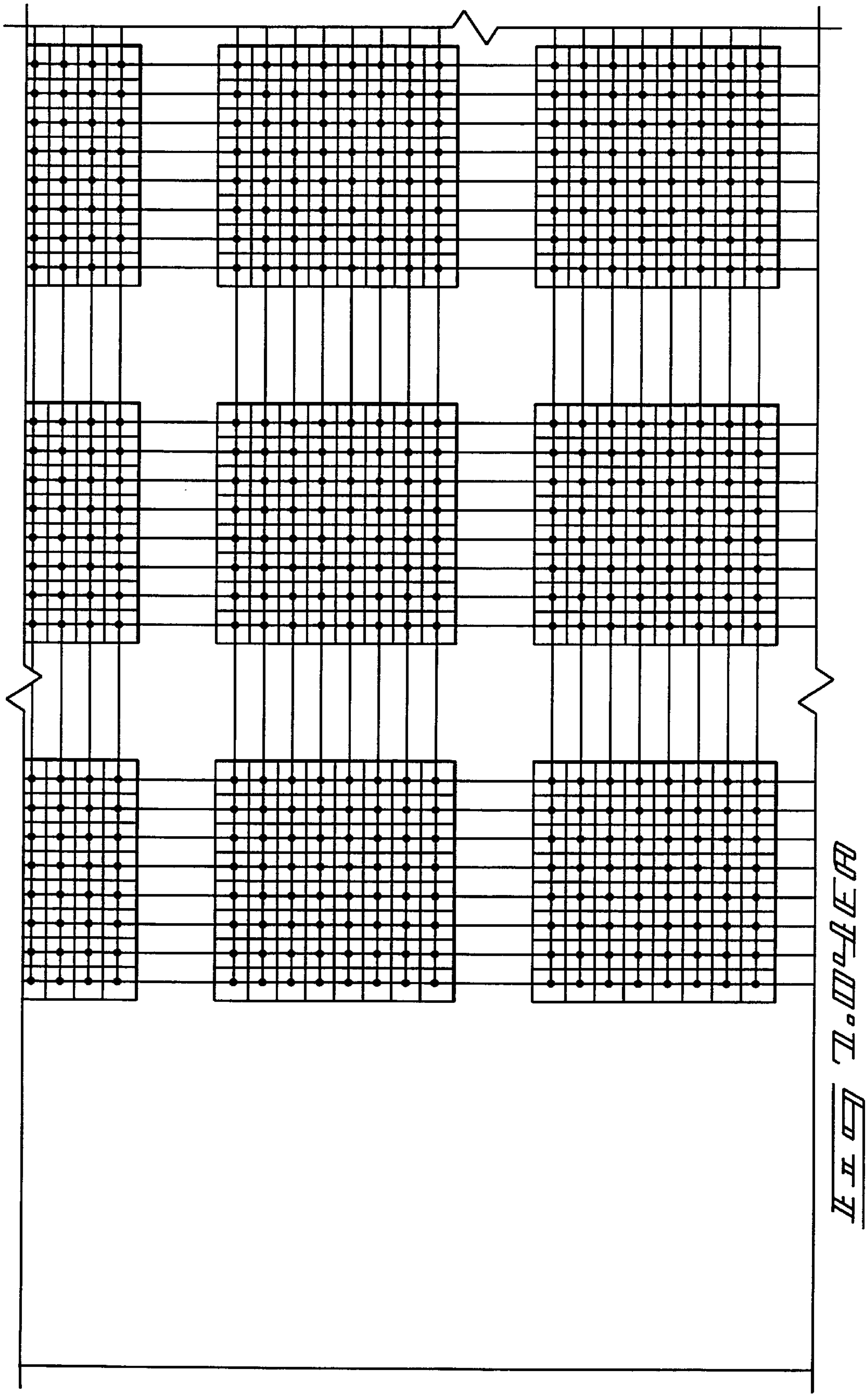
Fig. 7.04EA

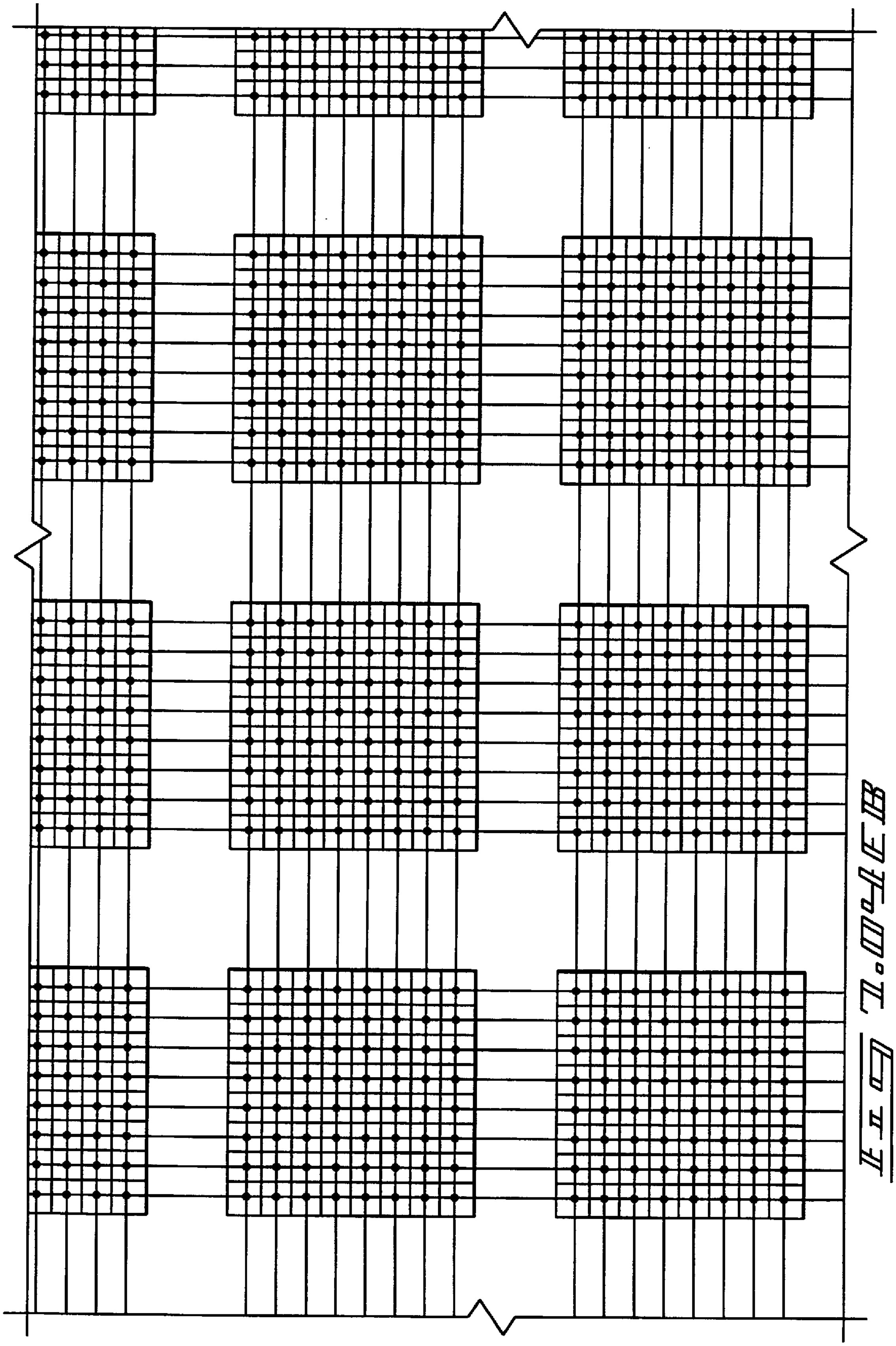
Fig. 7.04EB

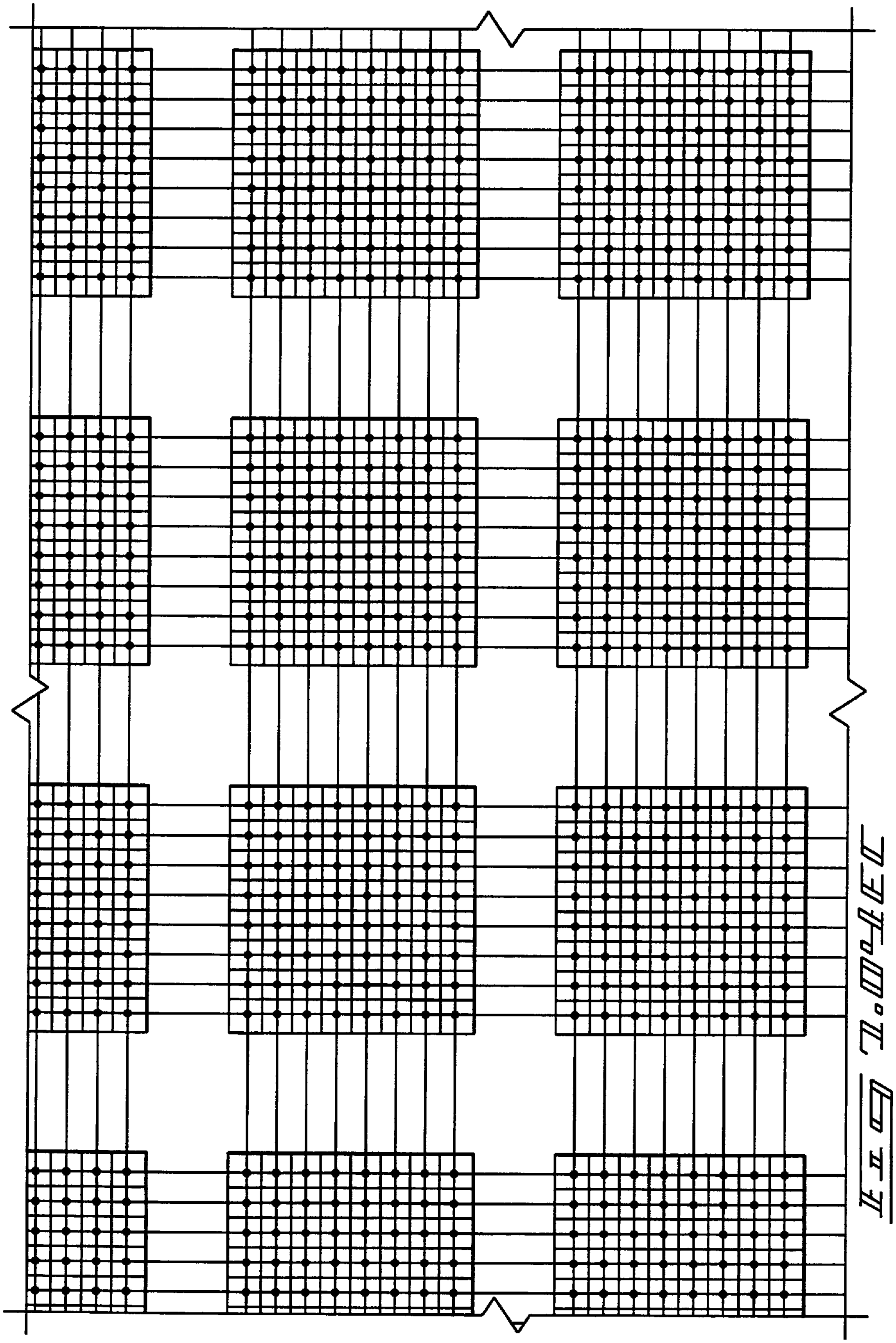
Fig. 7.04E

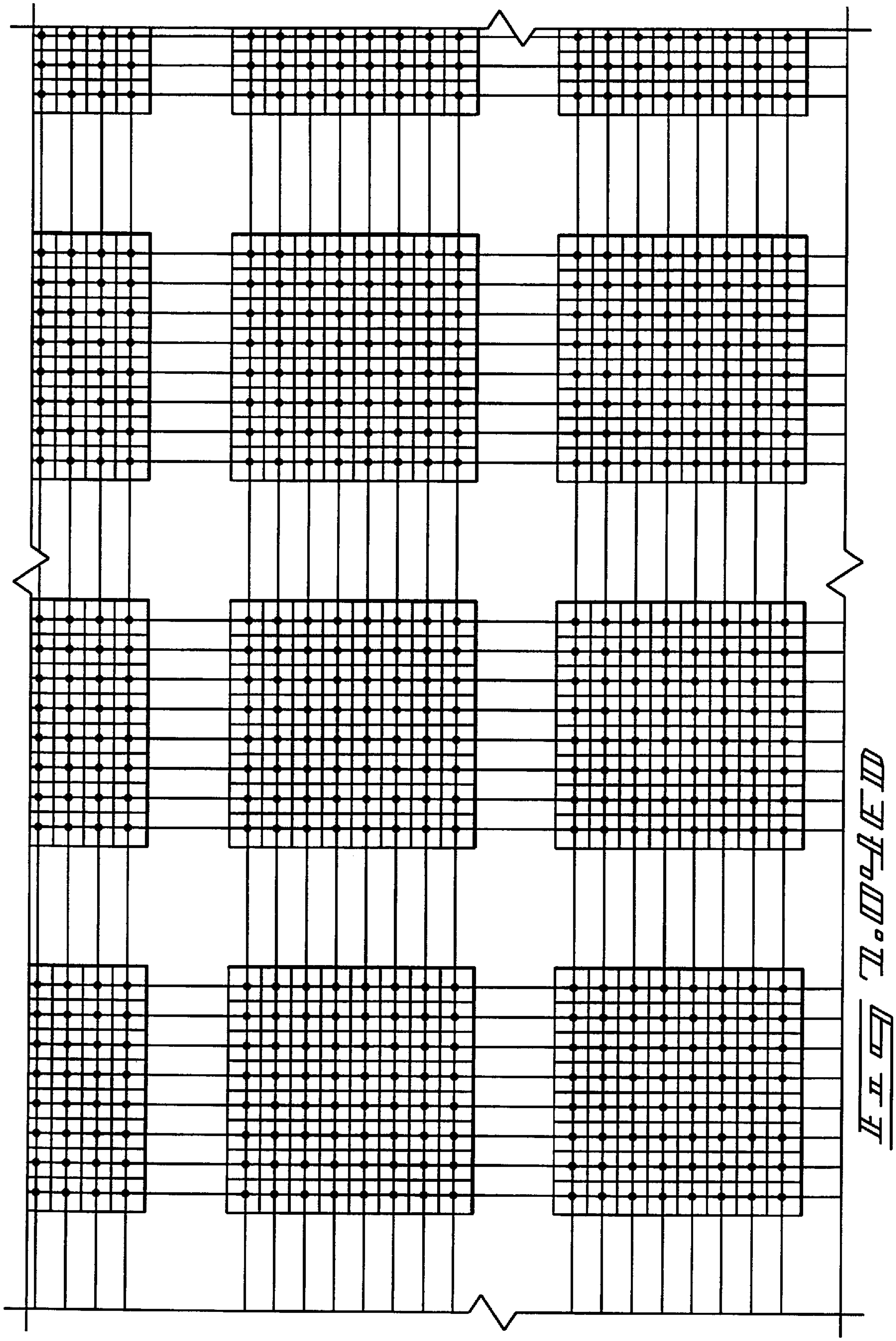
Fig. 7.04ED

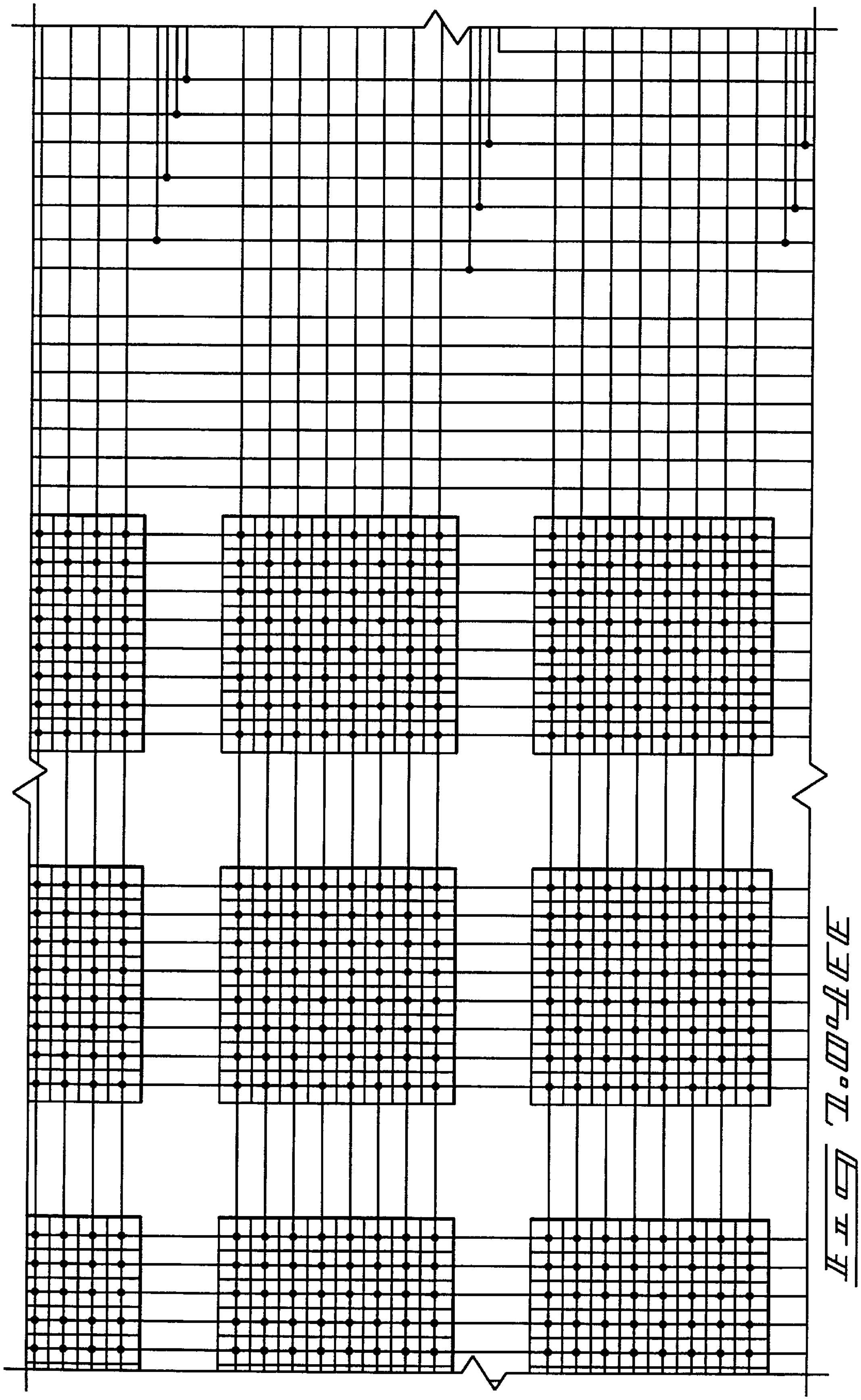
Fig. 7.04EE

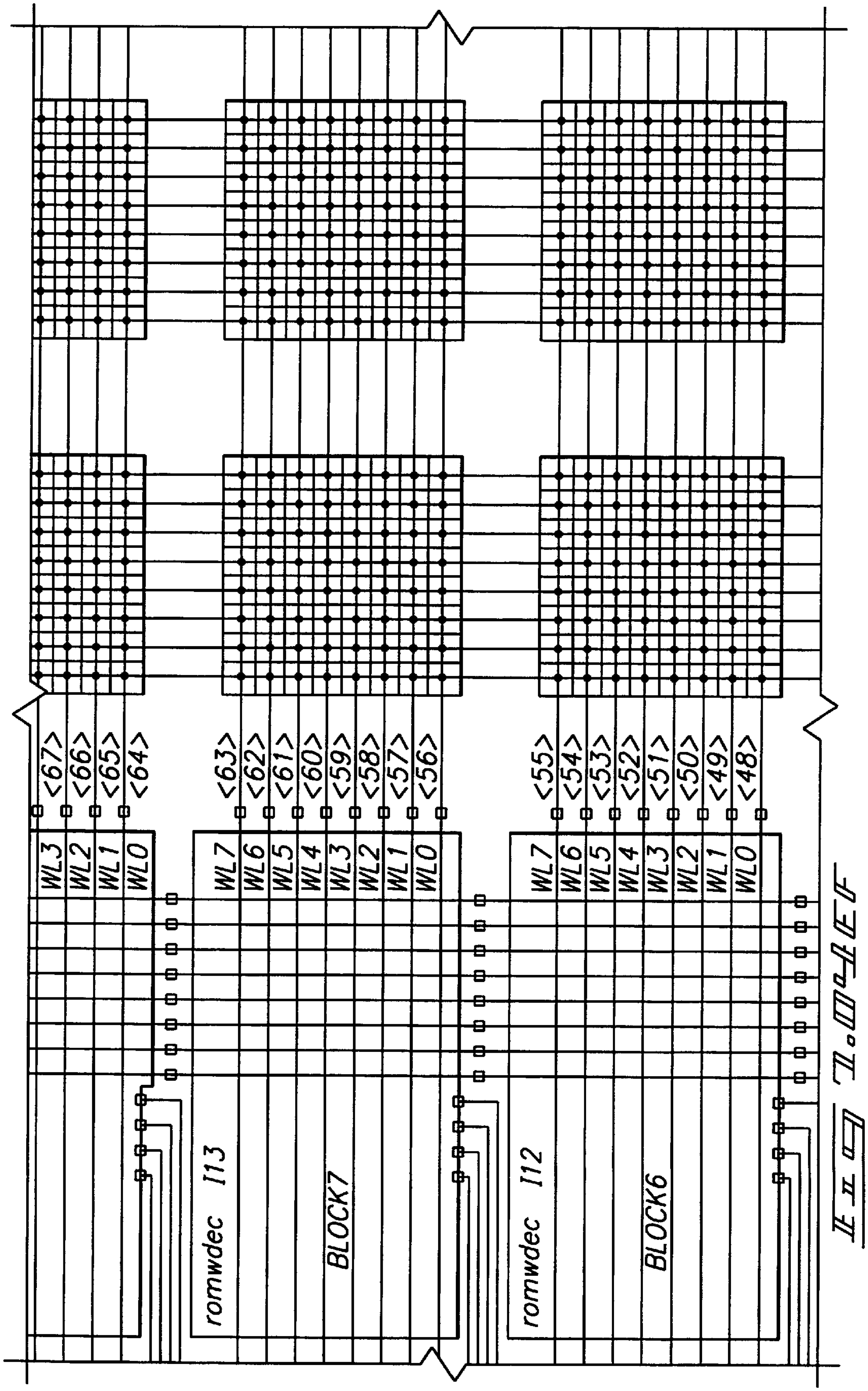
FIG. 7.04EF

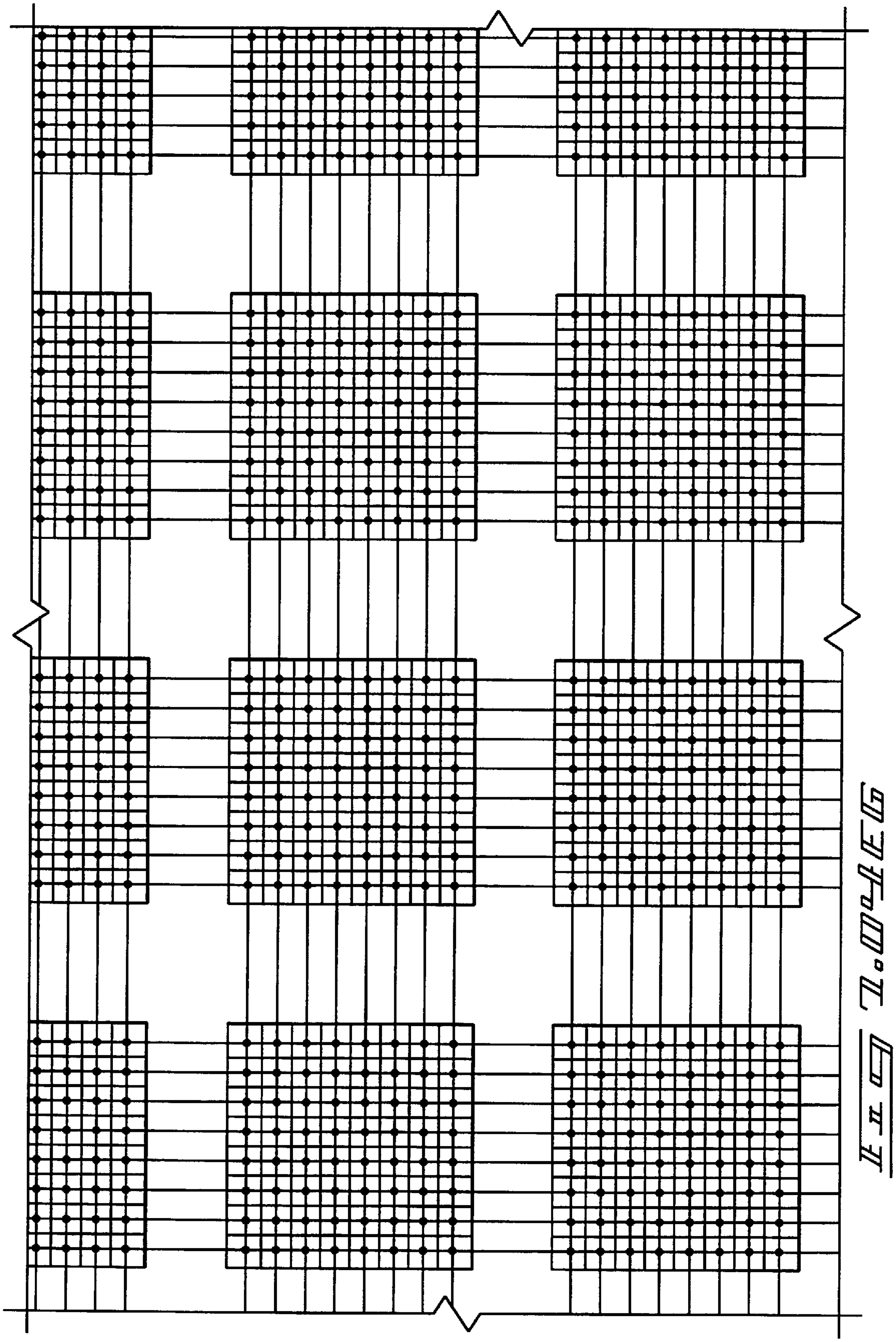
Fig 7.04EG

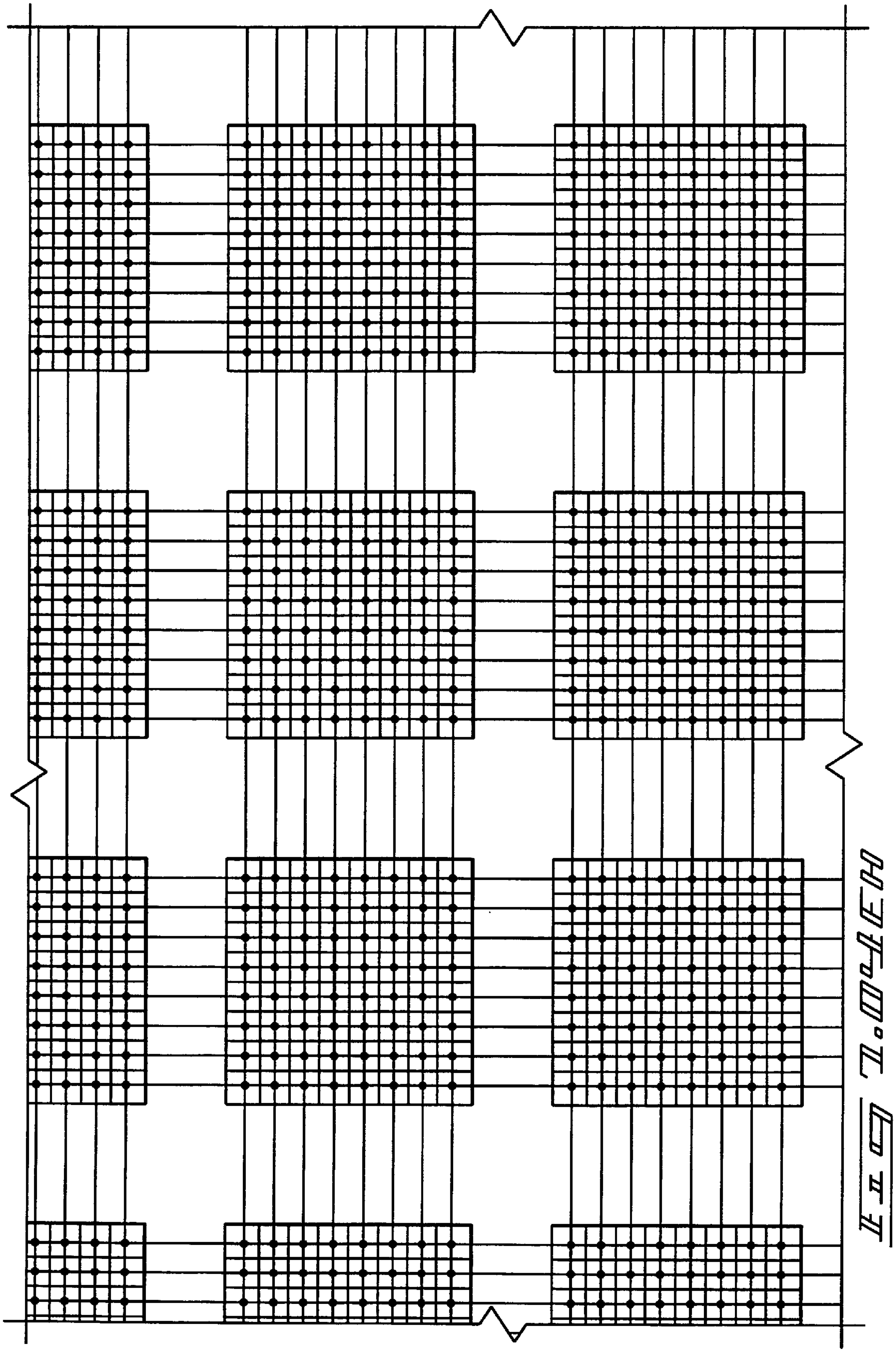
FIG. 7.04EH

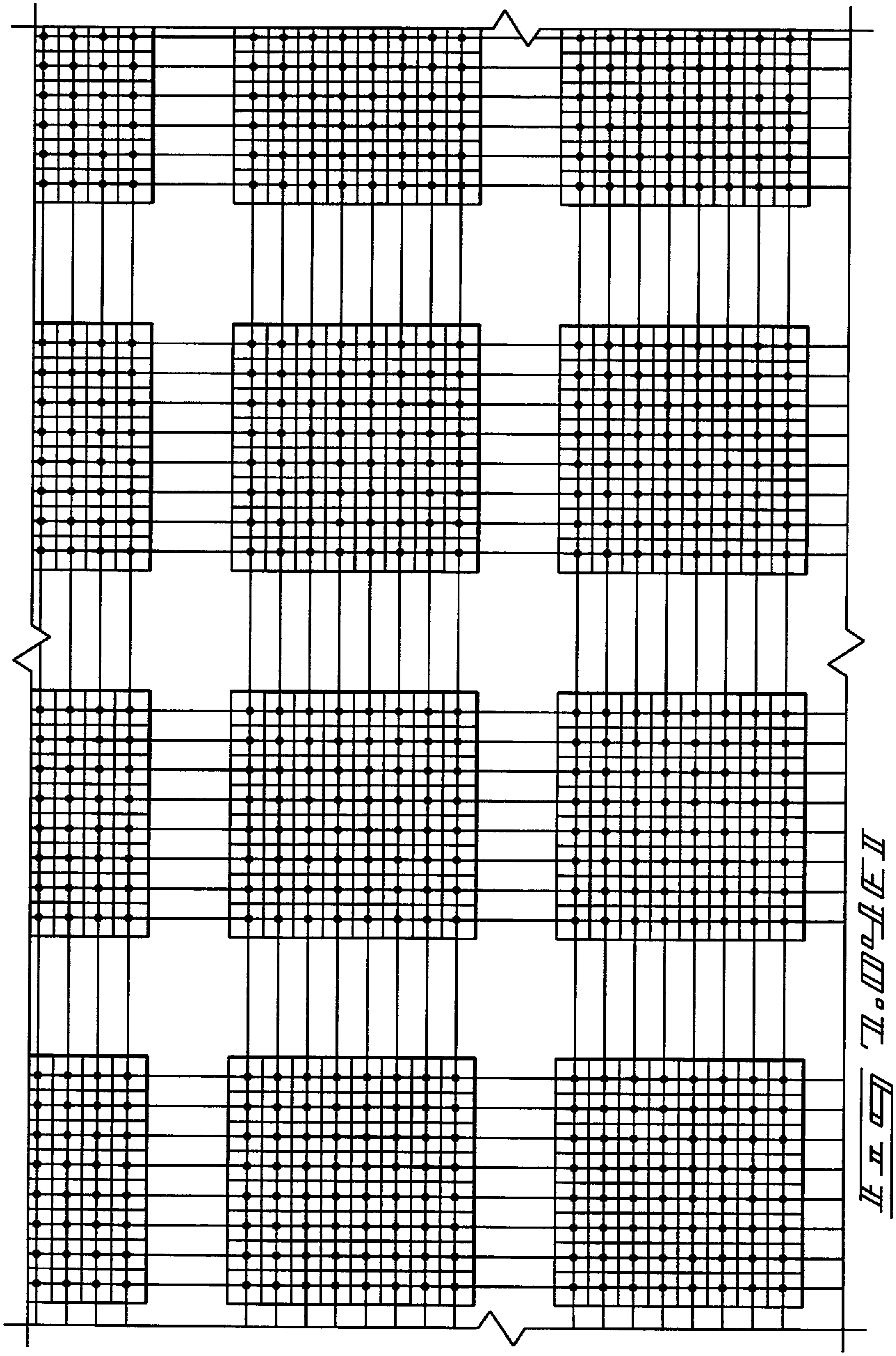
FIG. 7.04EI

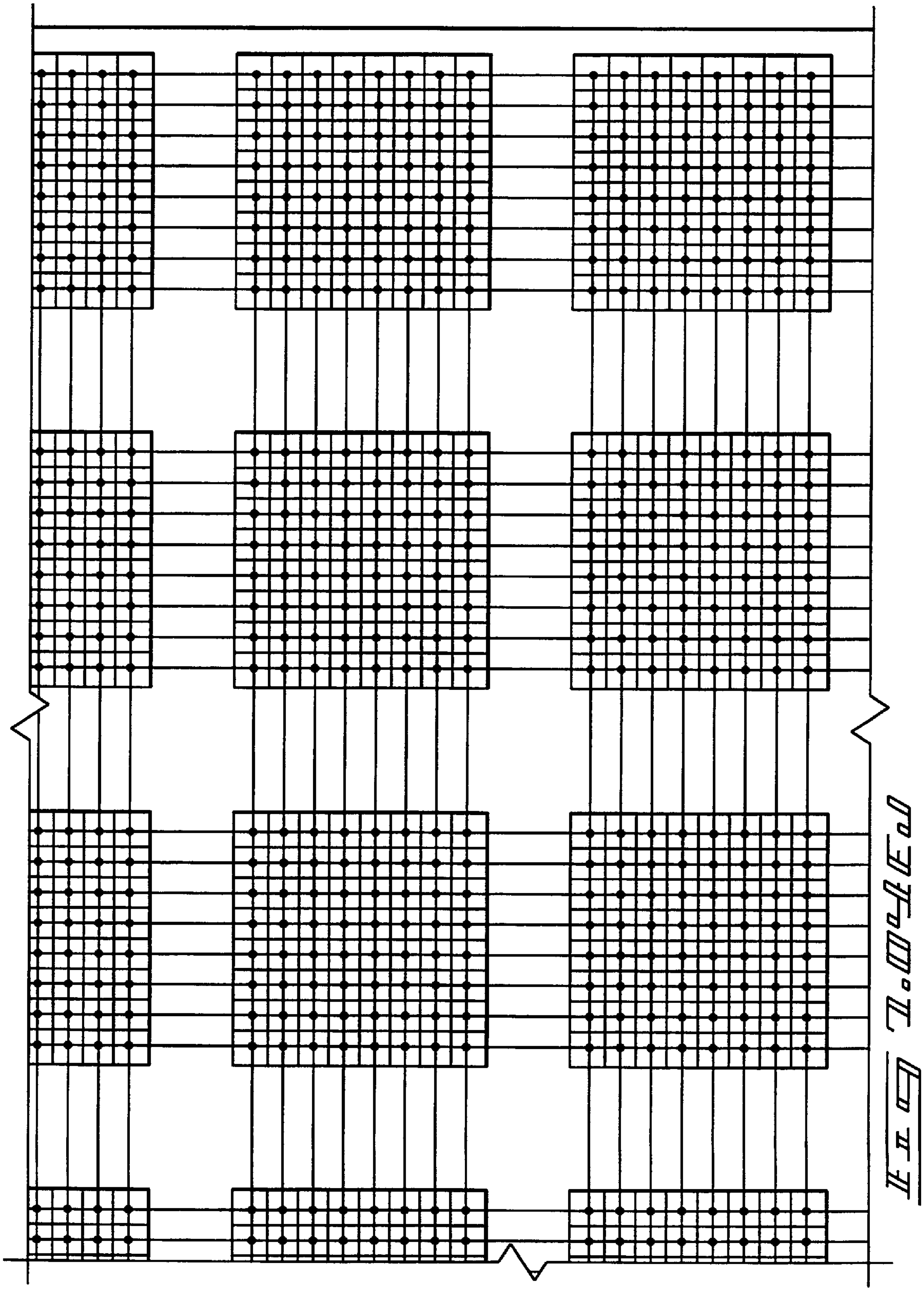
Fig. 7.04E2

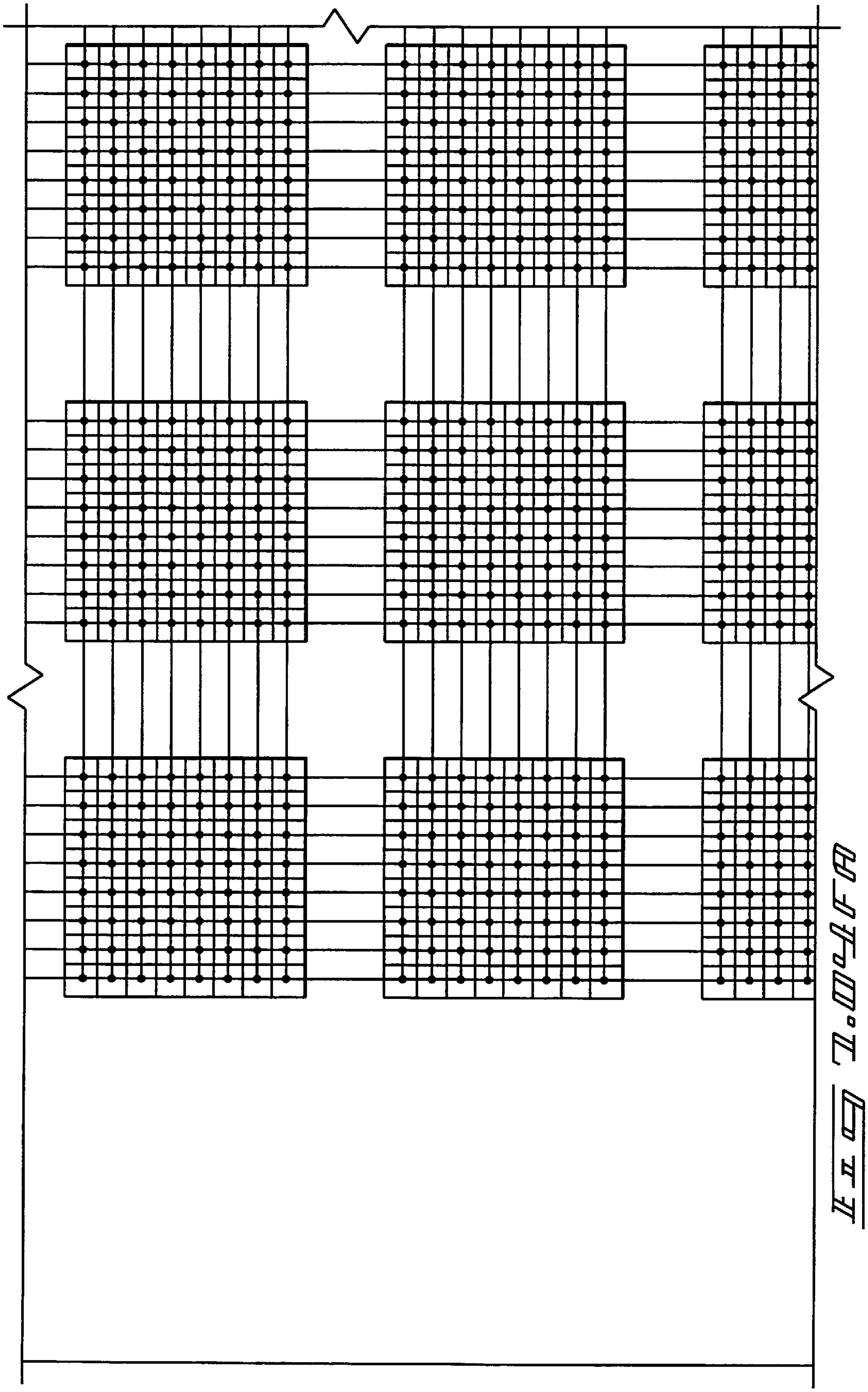
FIG. 7.04FA

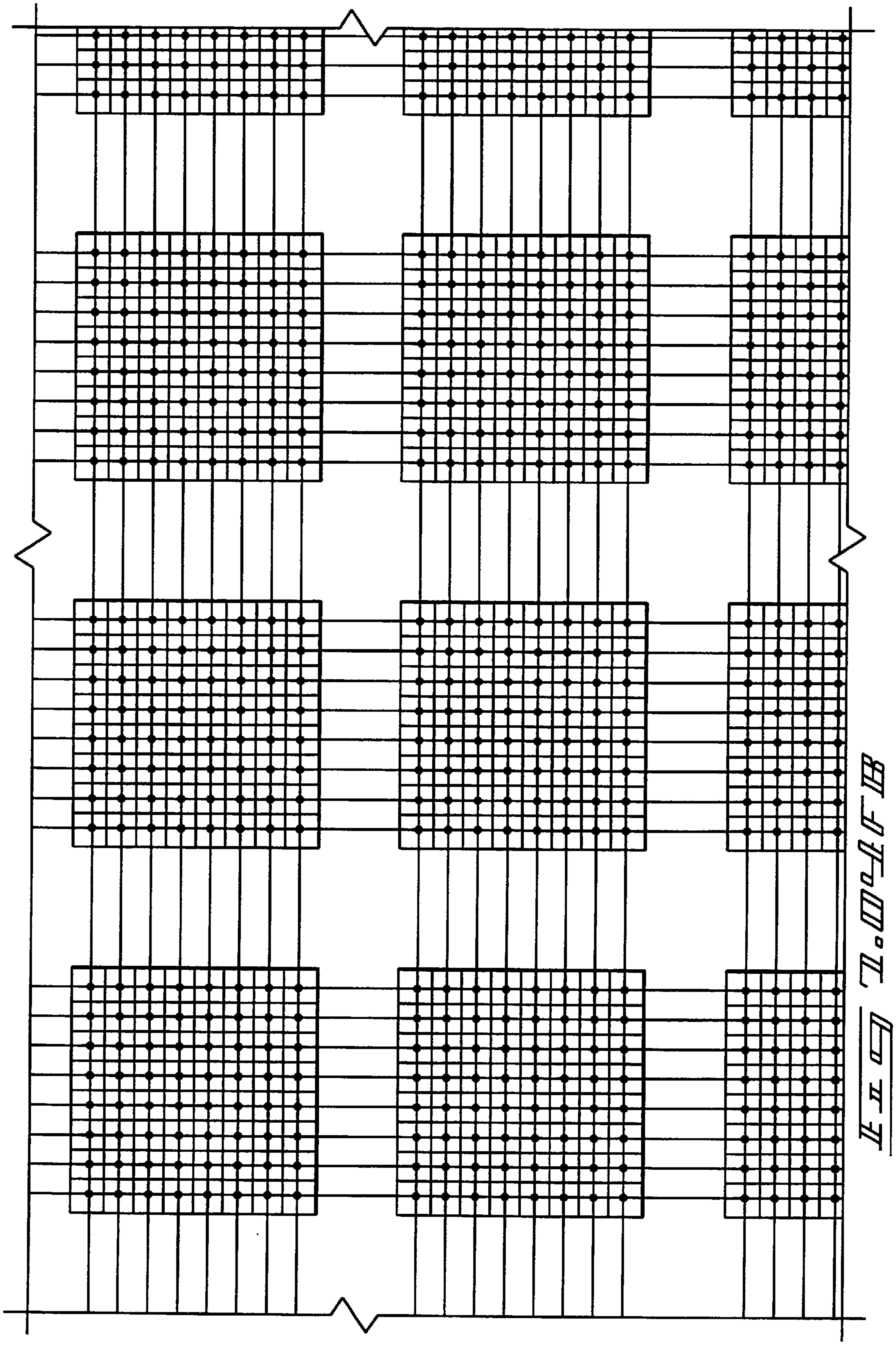
Fig. 7.04FB

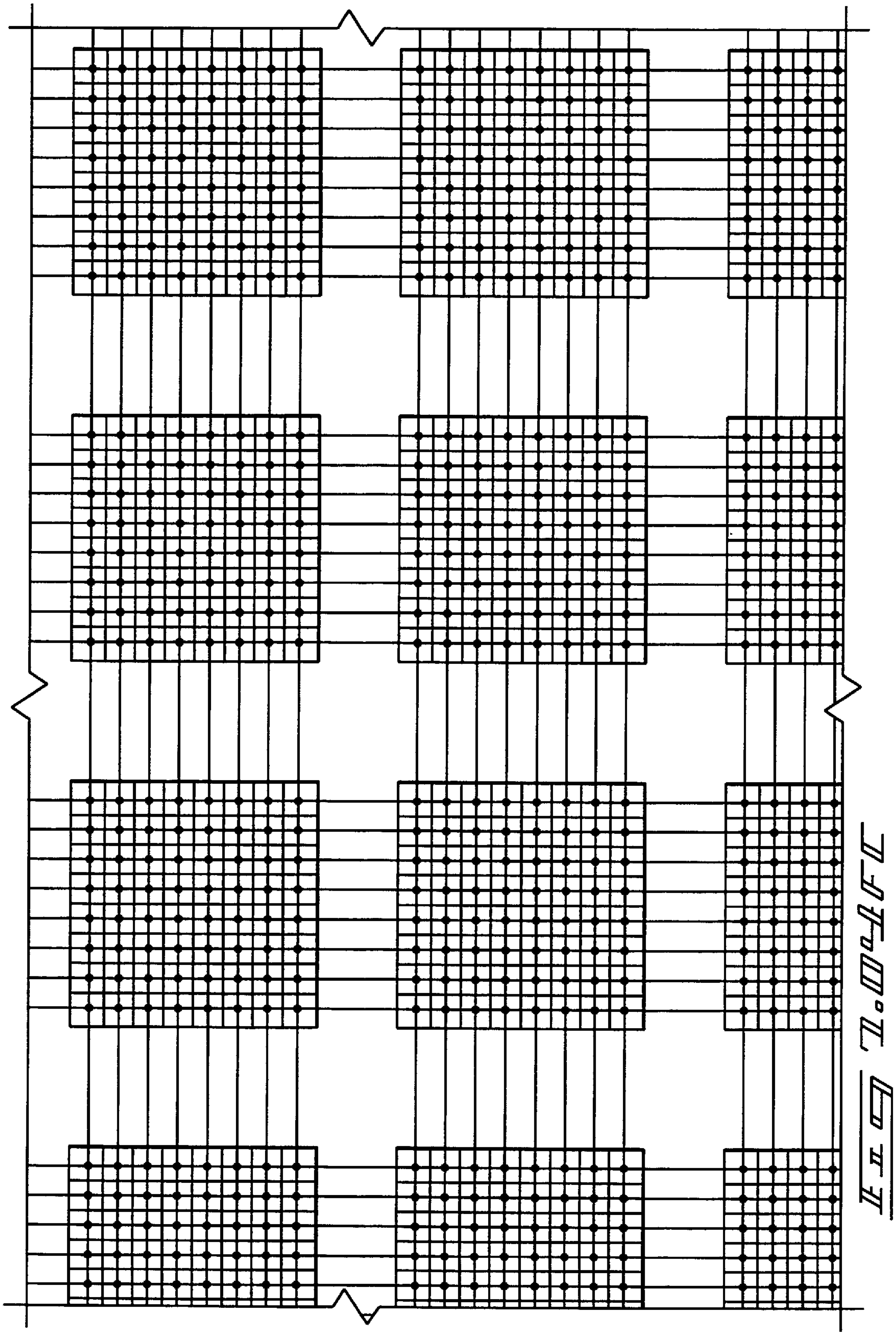
Fig. 7.04FC

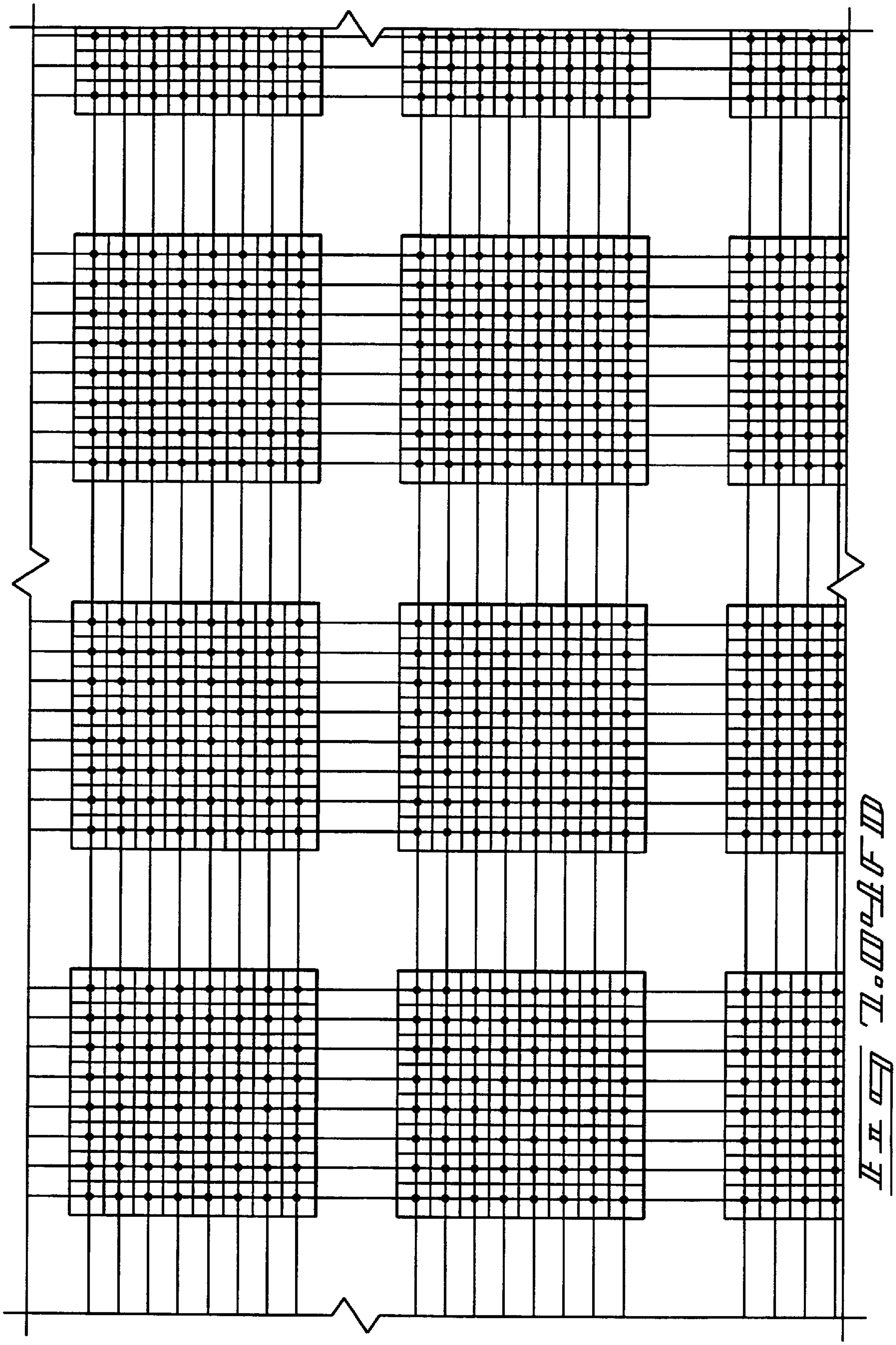
FIG. 7.04FD

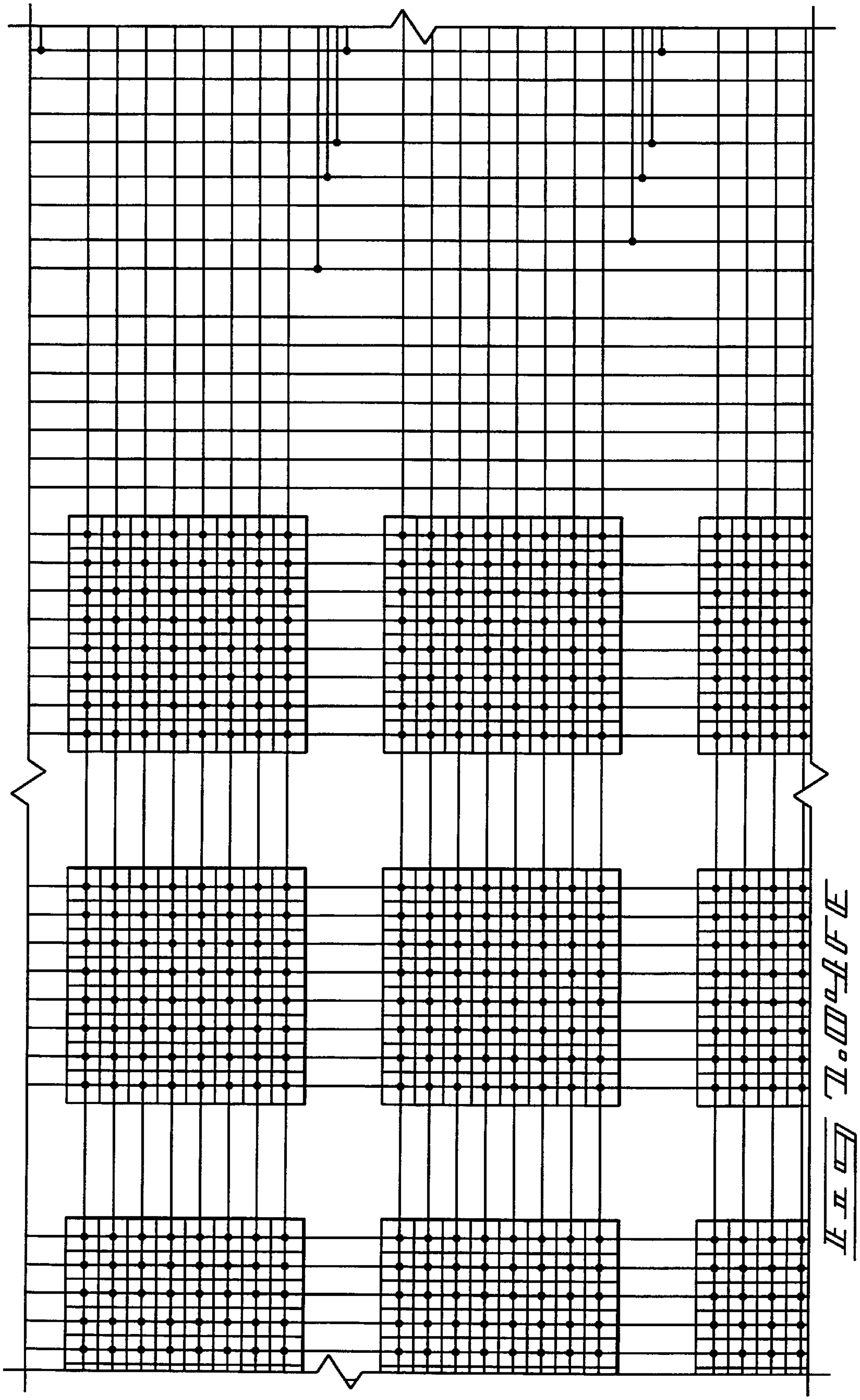
Fig. 7.04FF

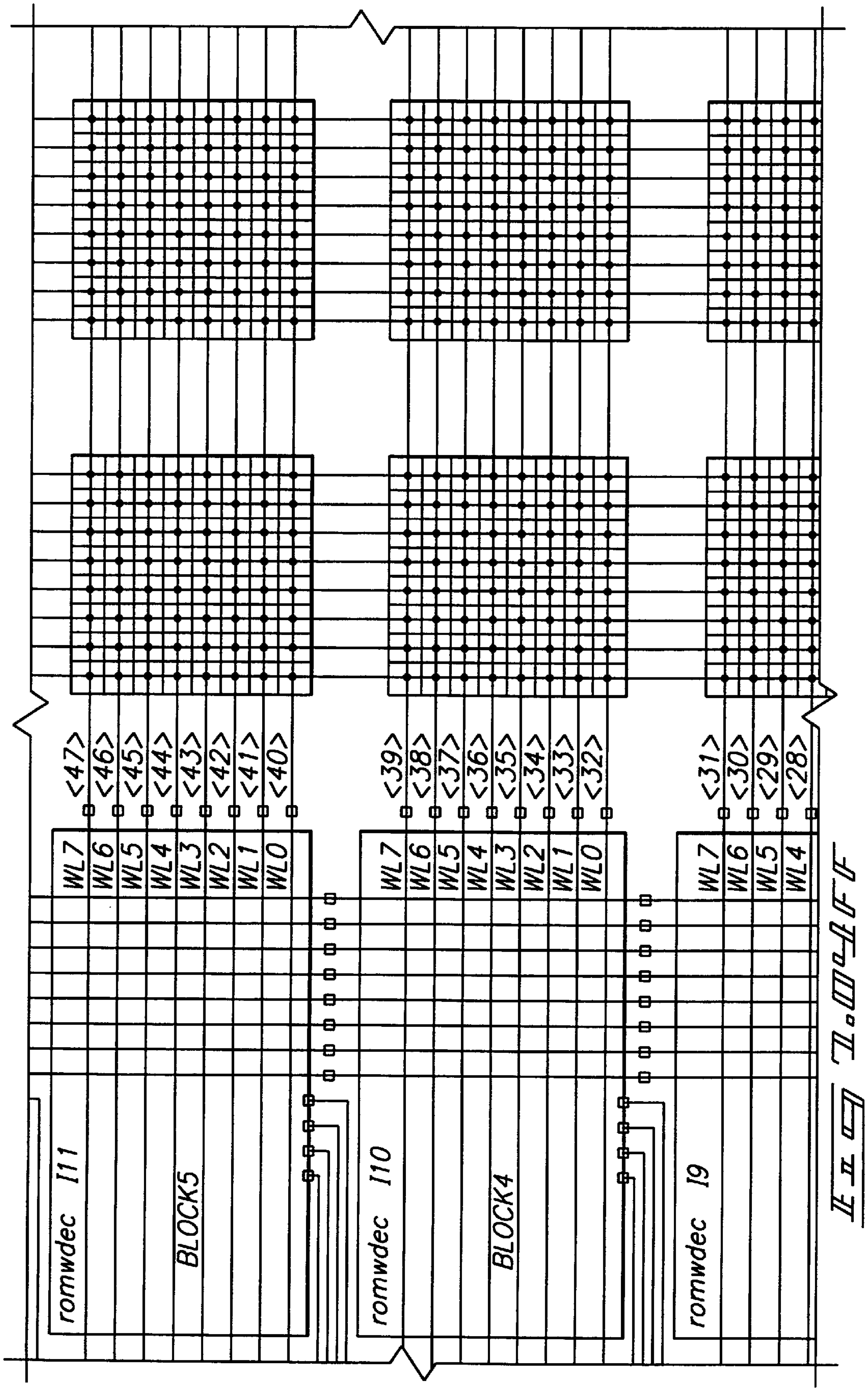
Fig. 7.04FF

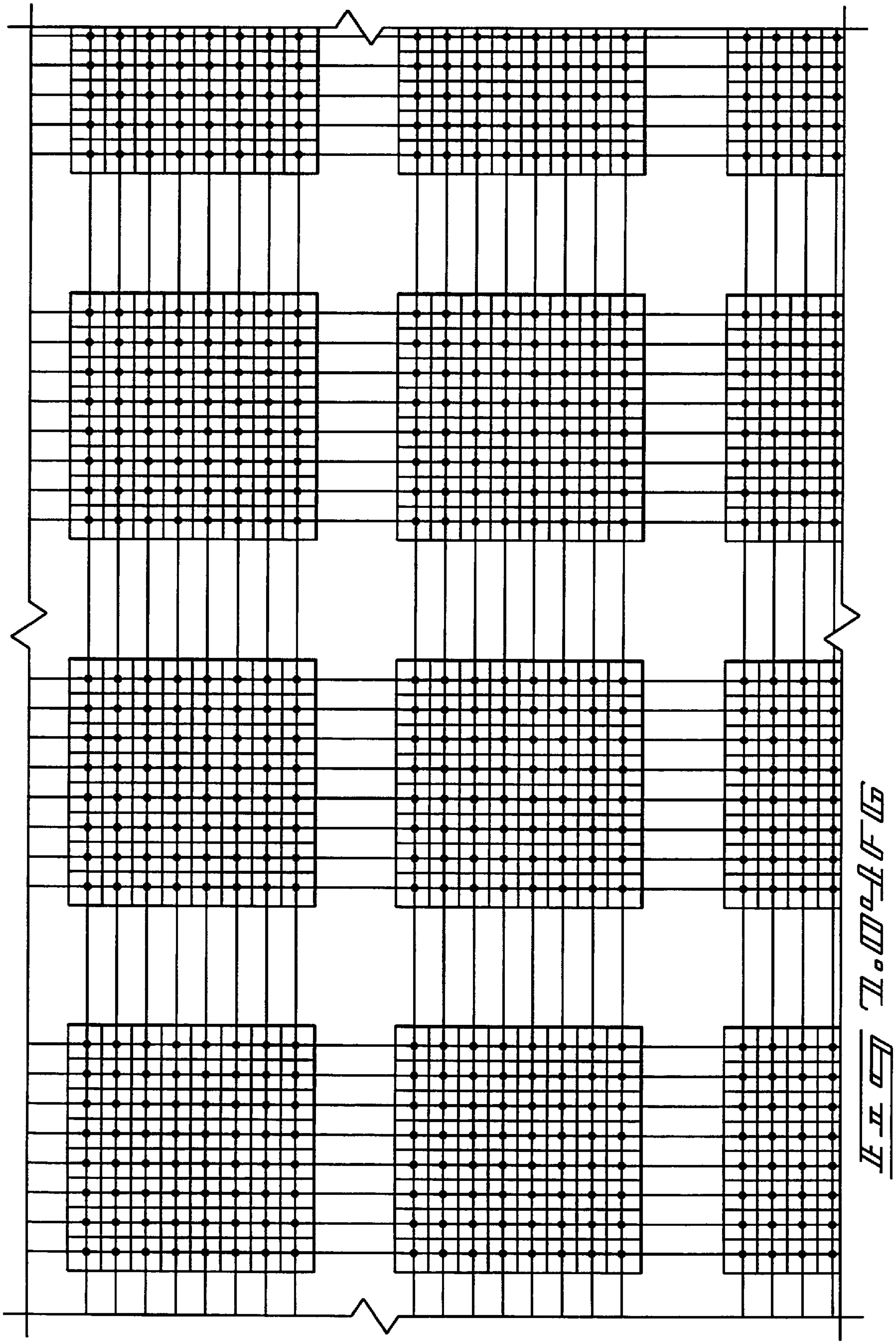
FIG. 7.04G

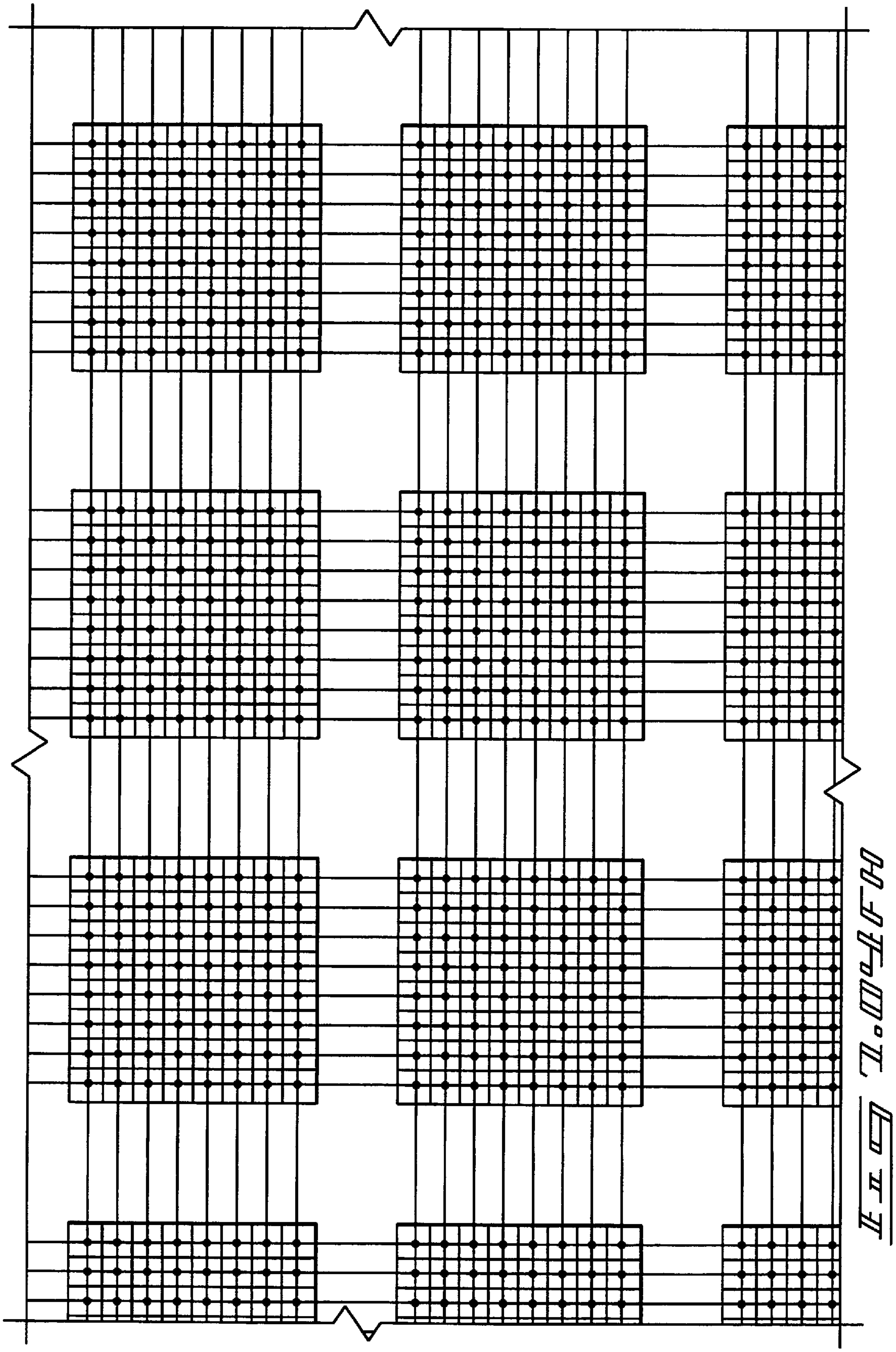
Fig. 7.04AA

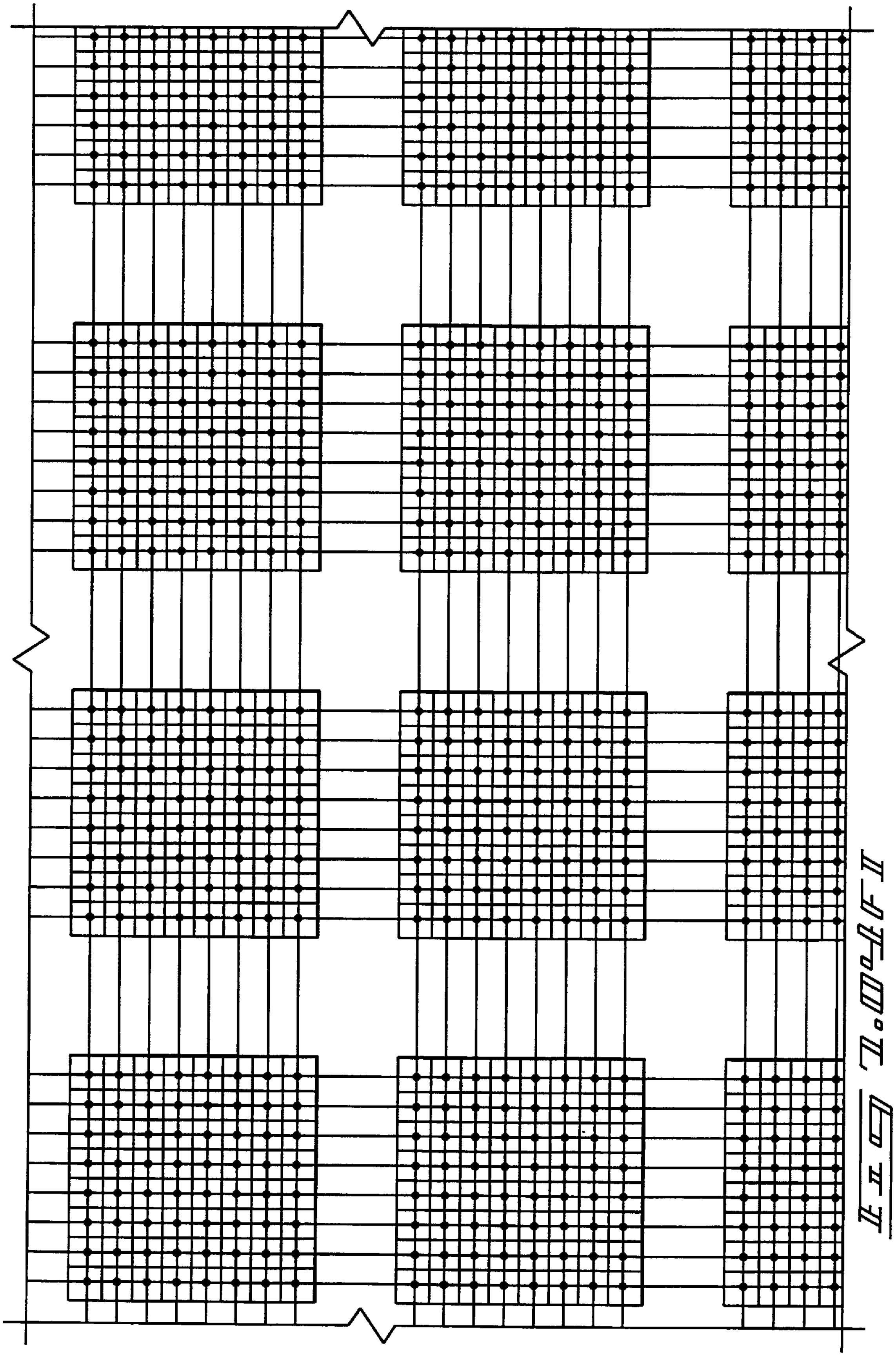
FIG. 7.04H

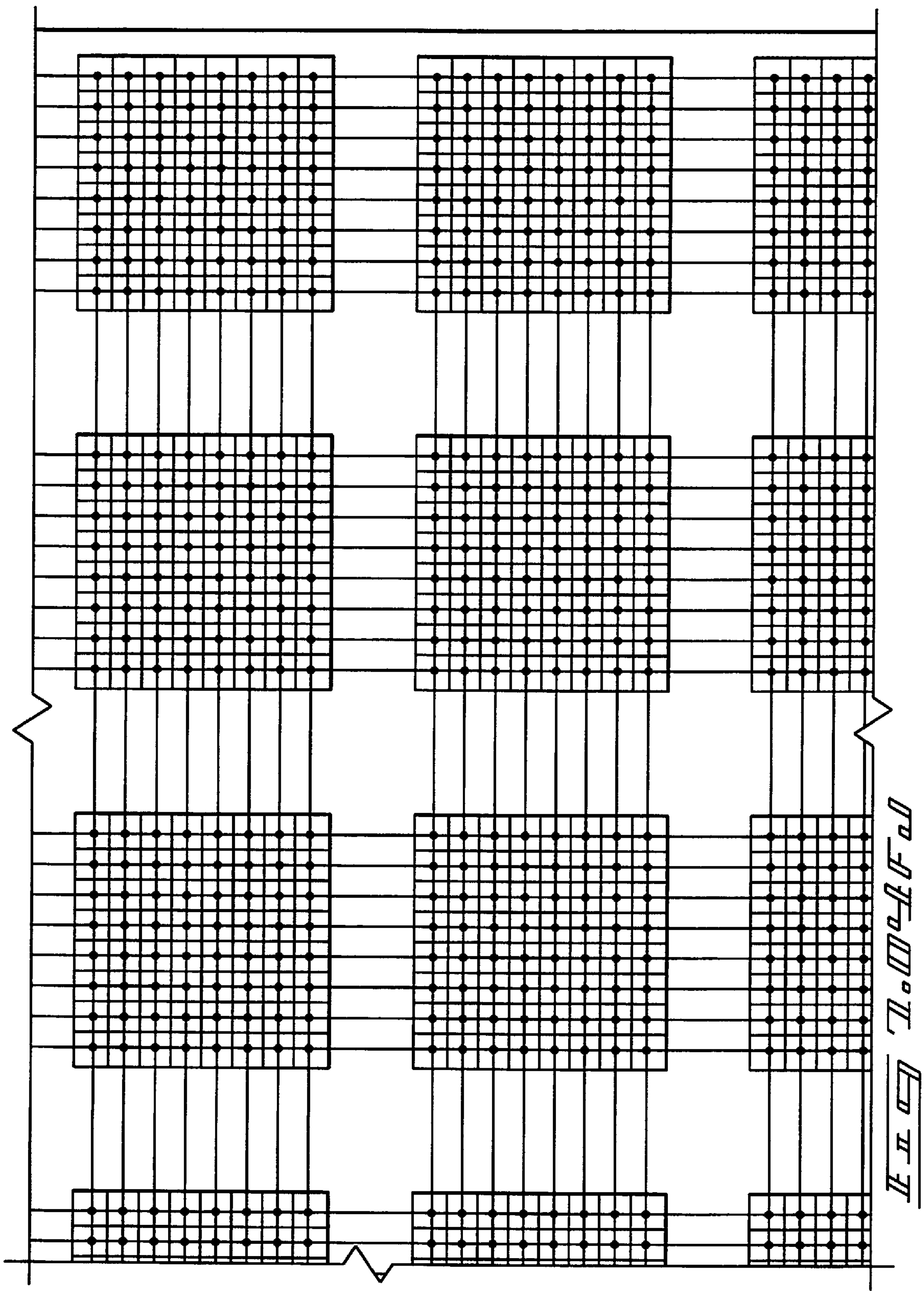
Fig. 7.04Fd

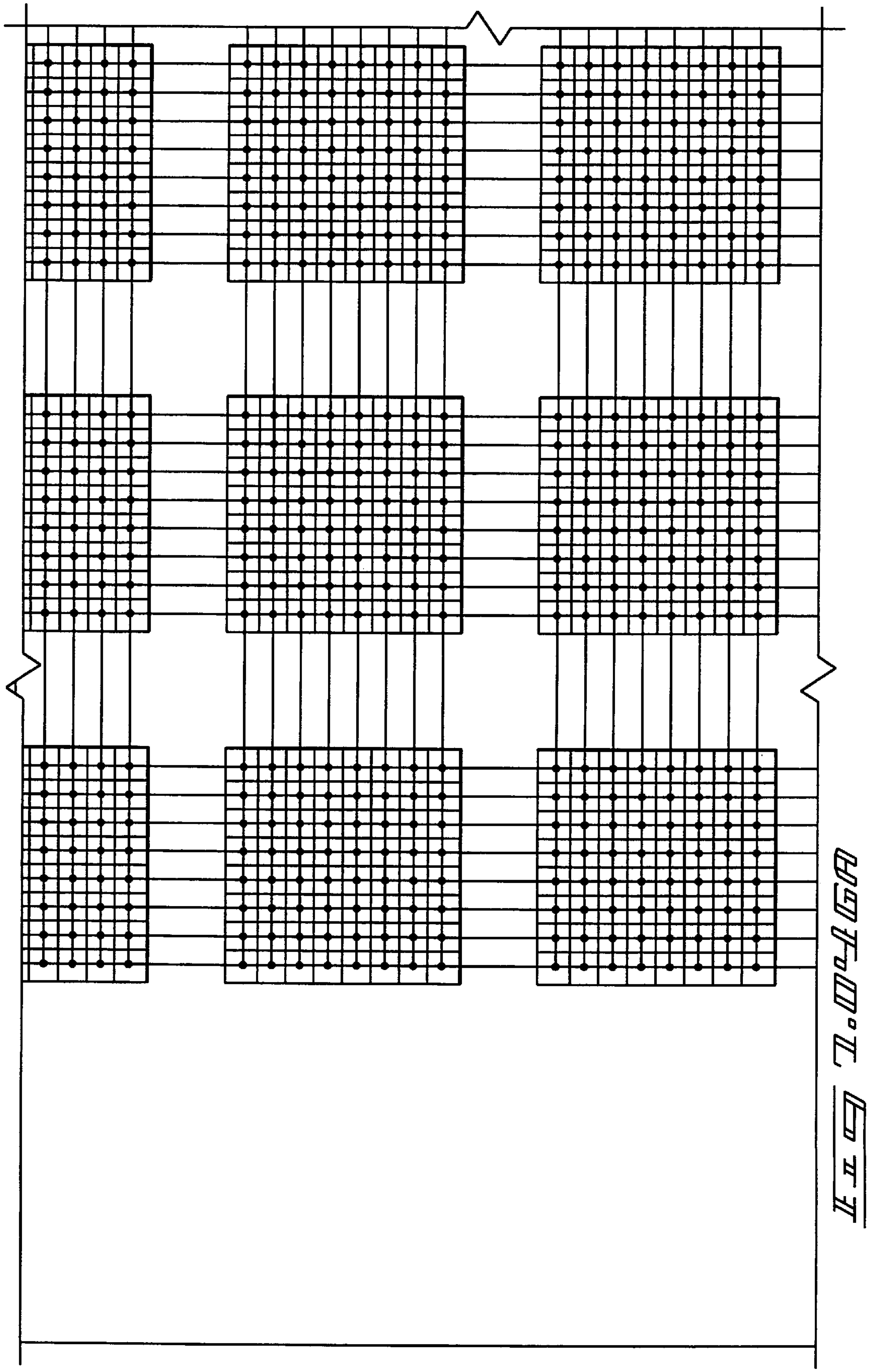
FIG. 7.04GA

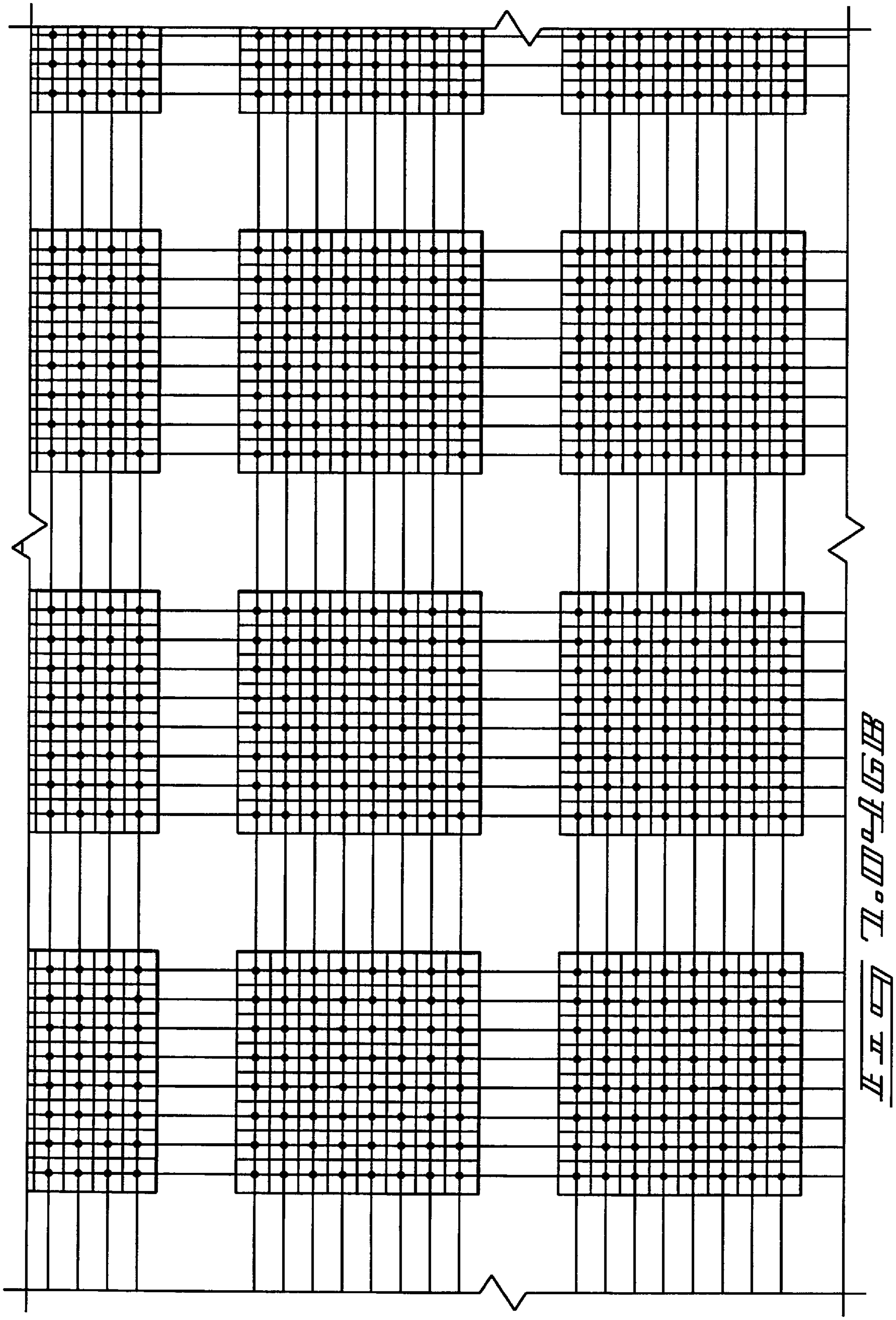
FIG. 7.046B

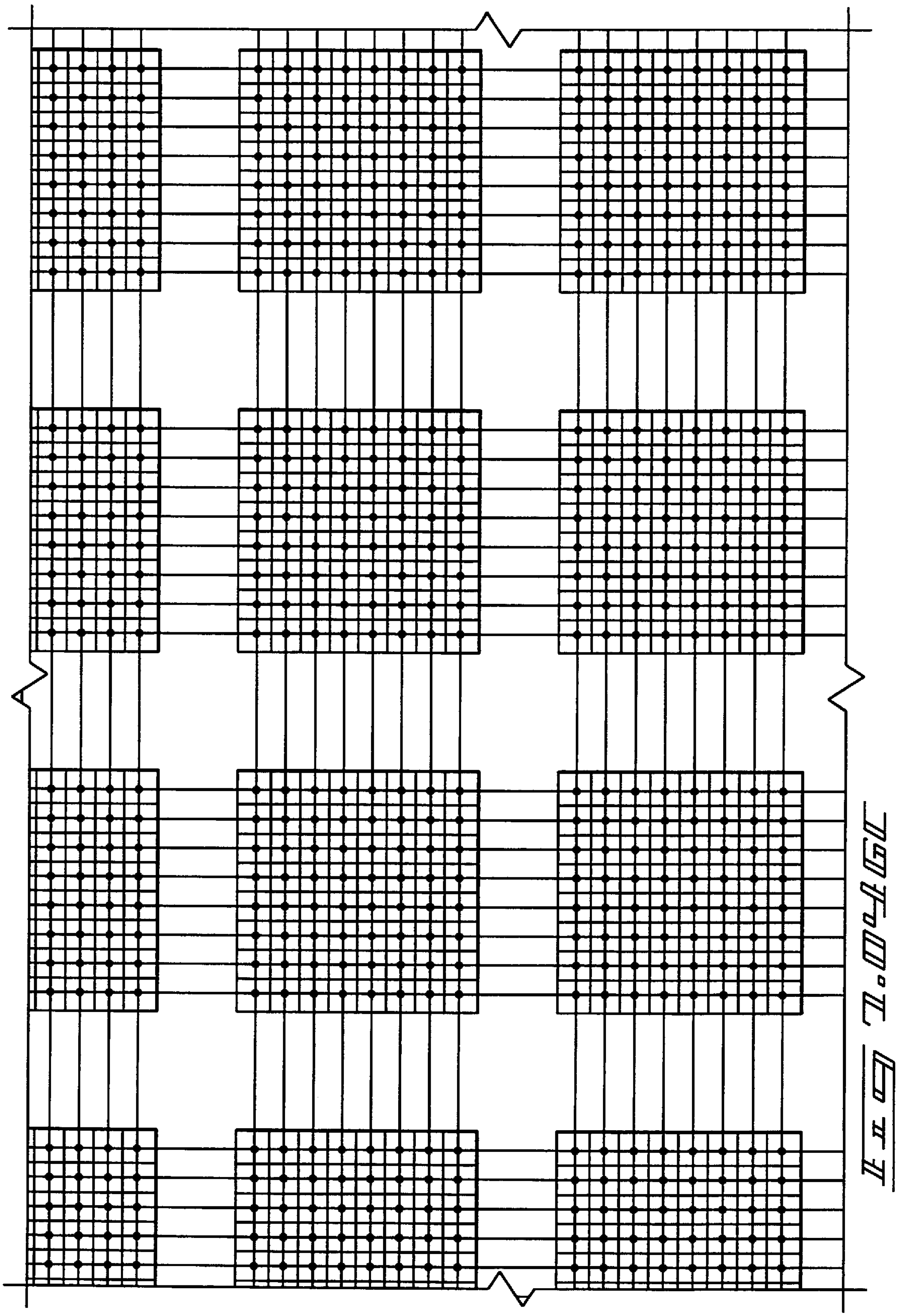
Fig. 7.04G

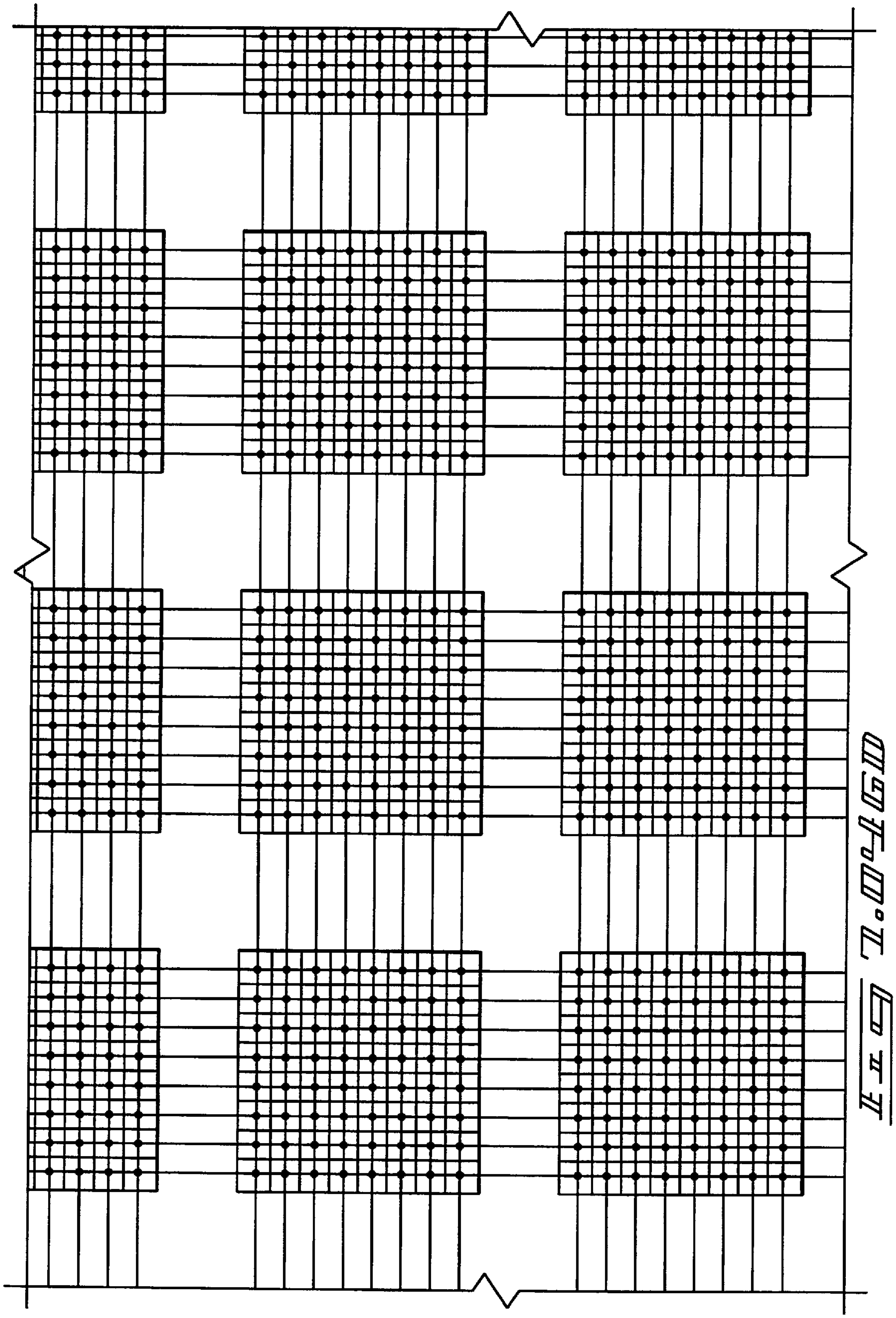
Fig. 7.04GD

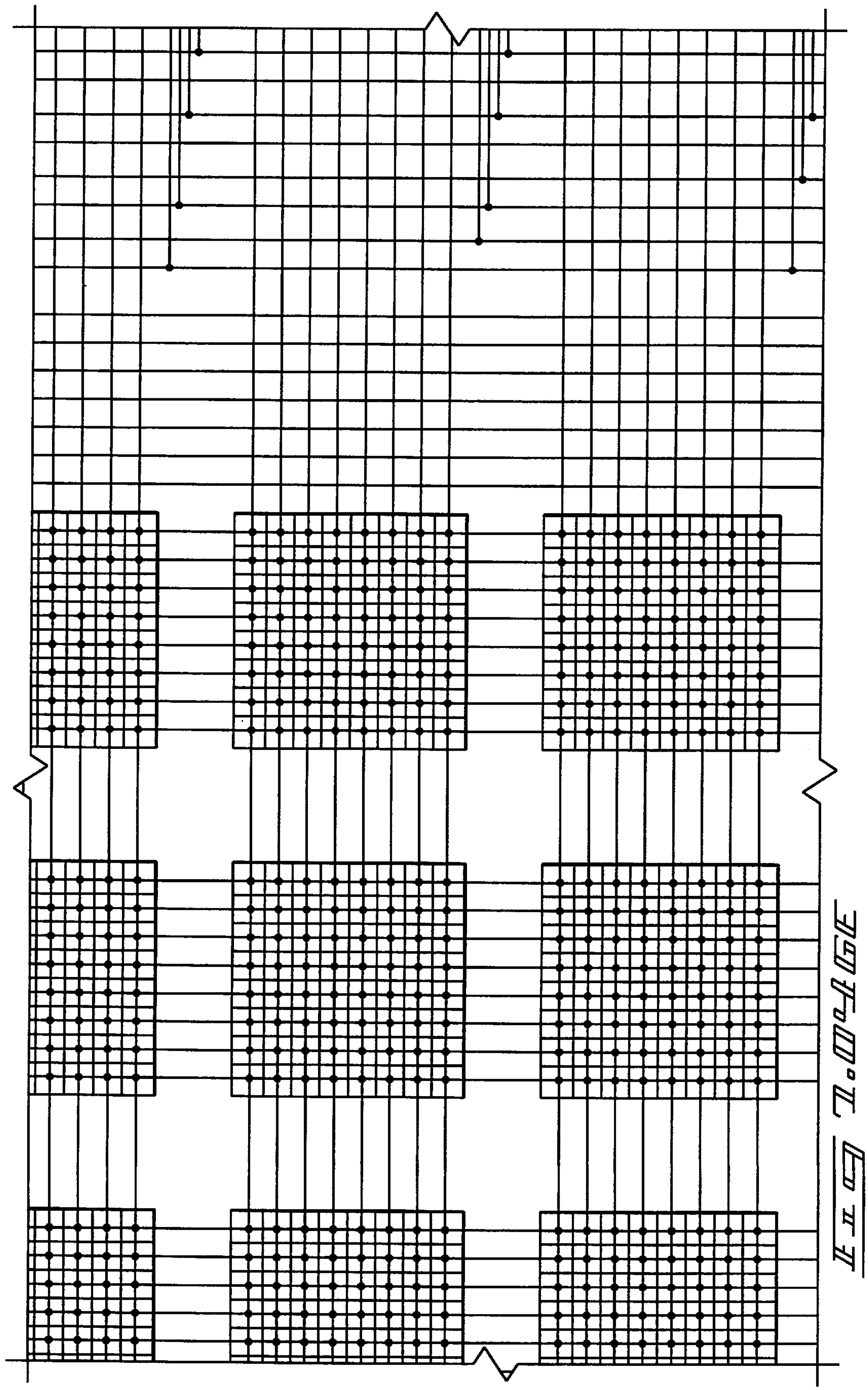
Fig. 7.04GE

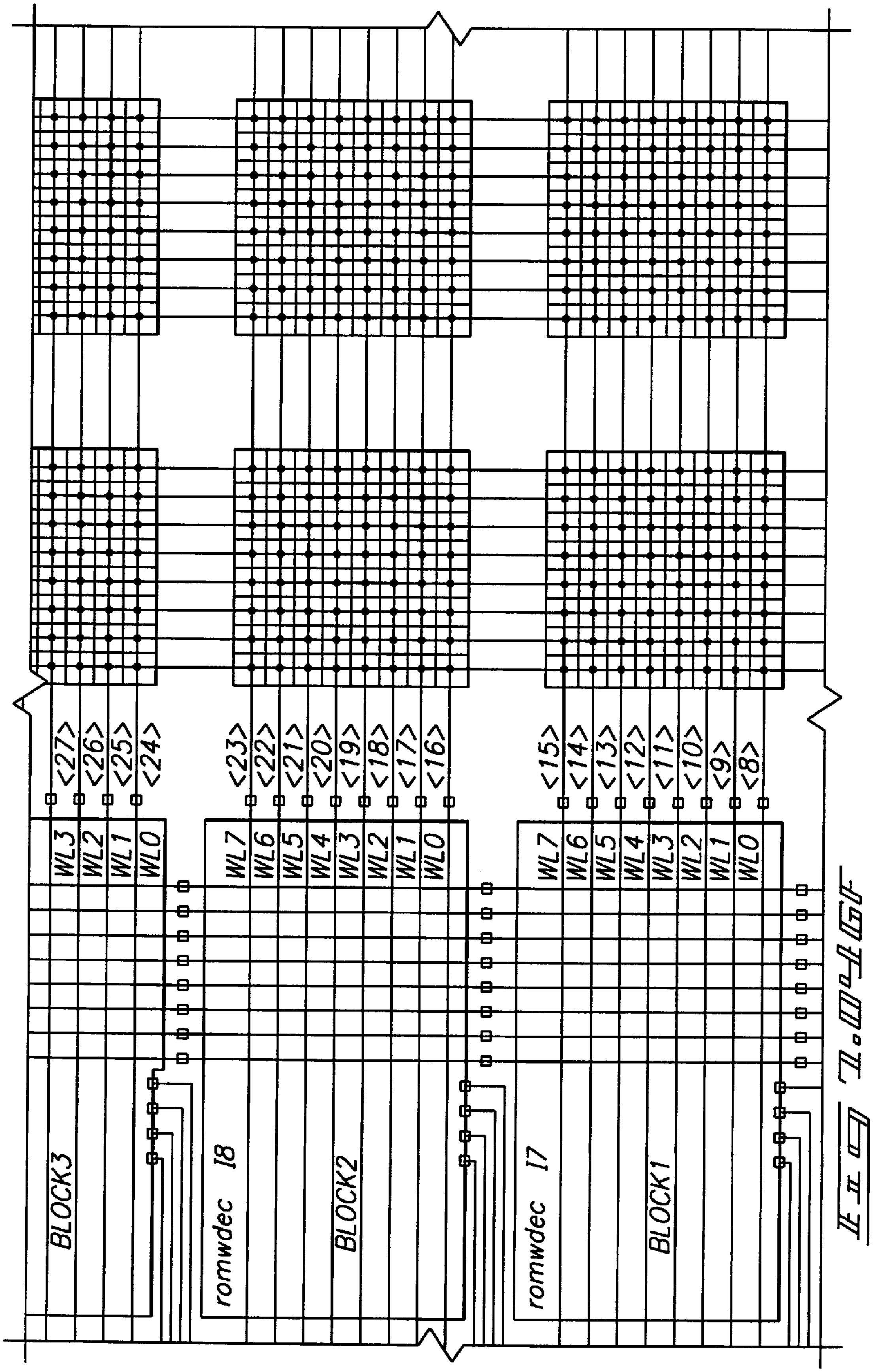
FIG 7.04GF

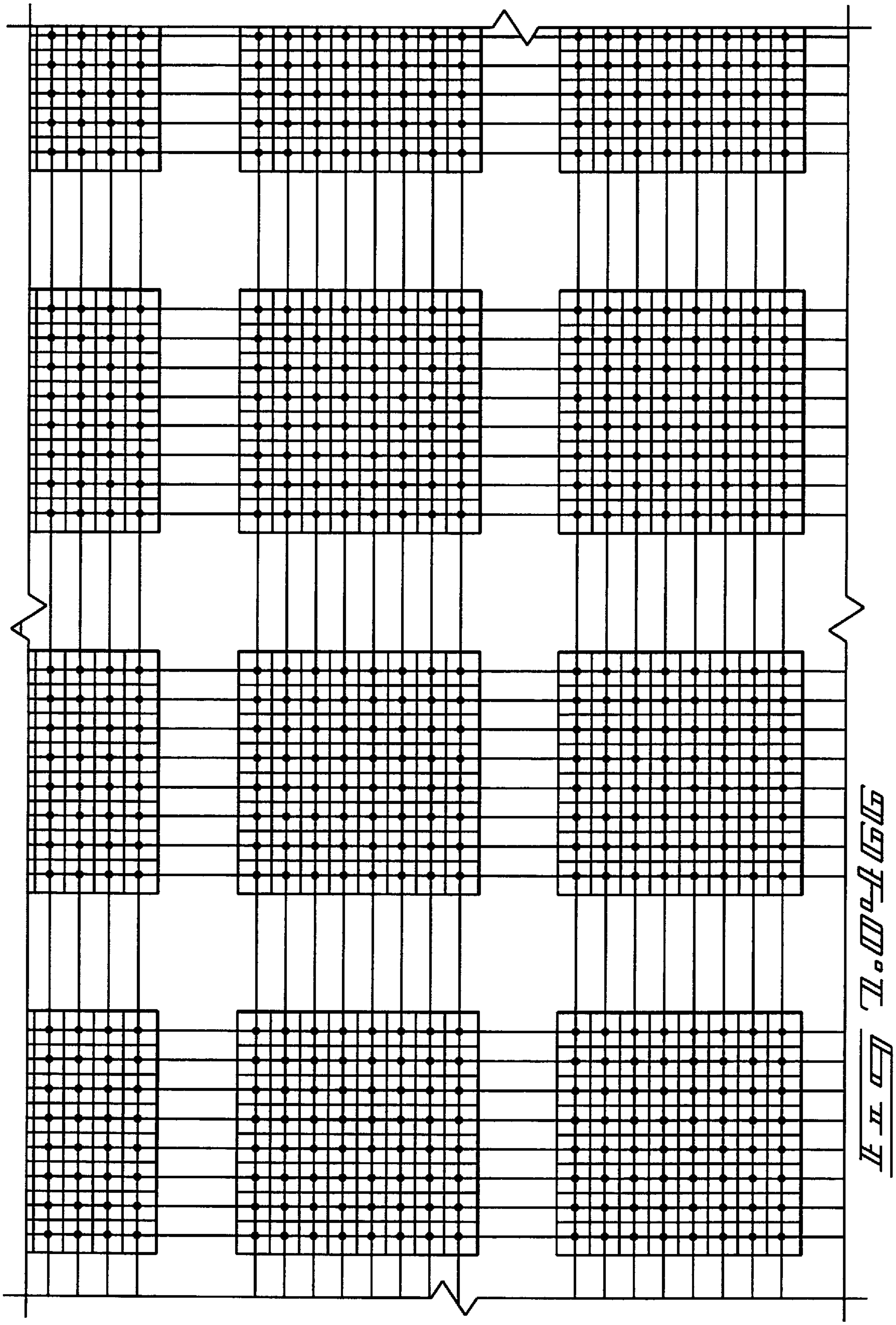
FIG. 7.04GG

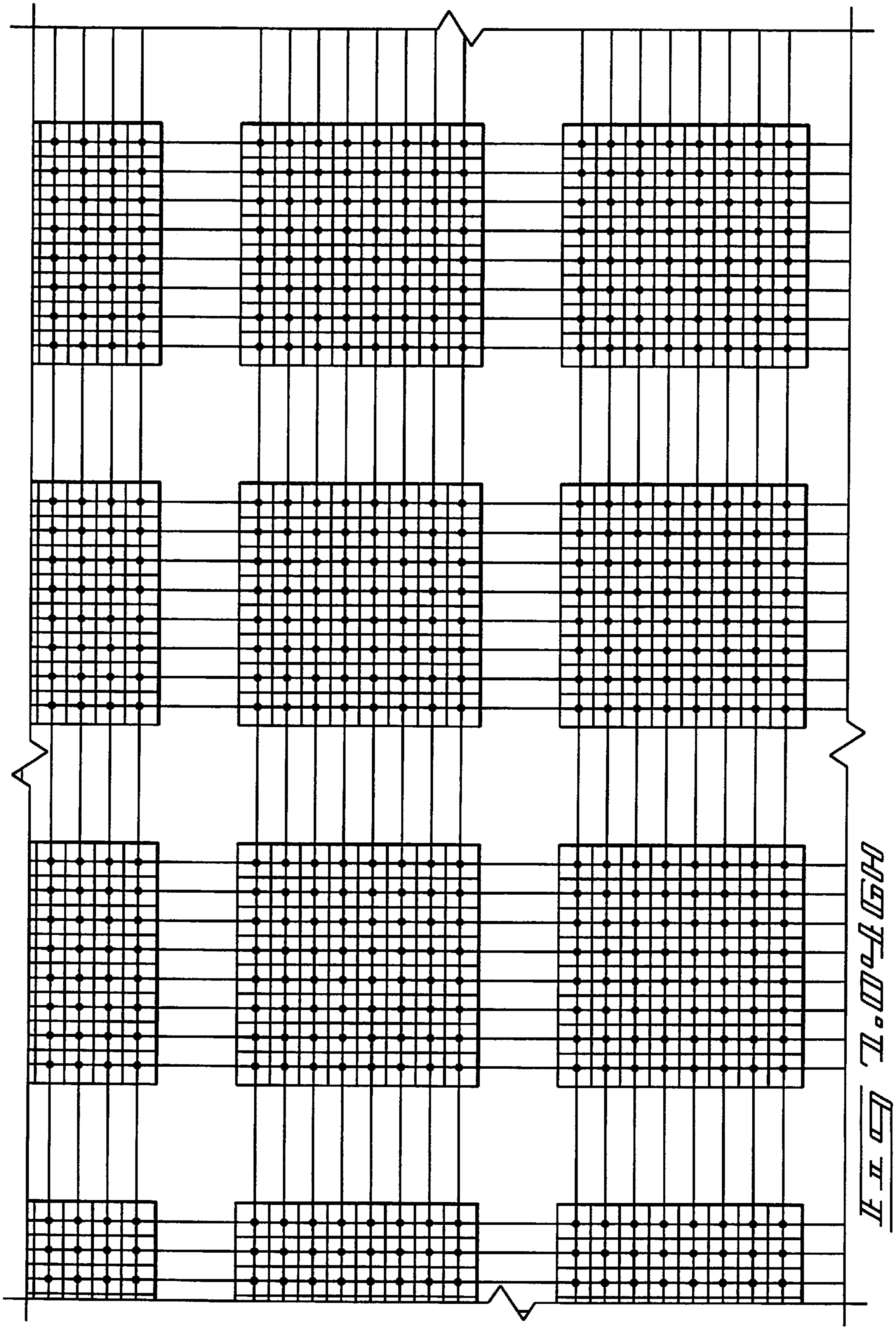
FIG. 7.04H

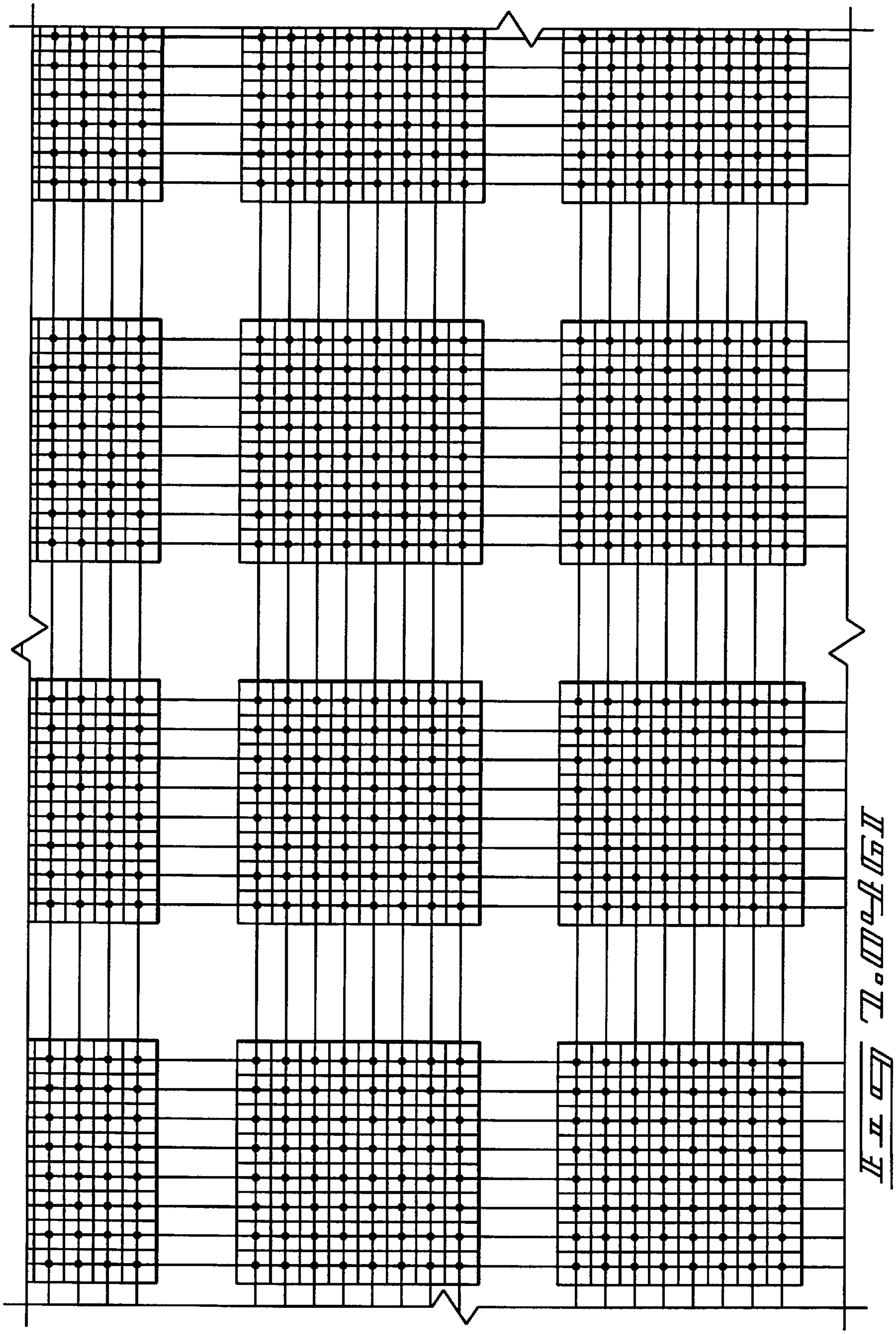
Fig. 7.0.1

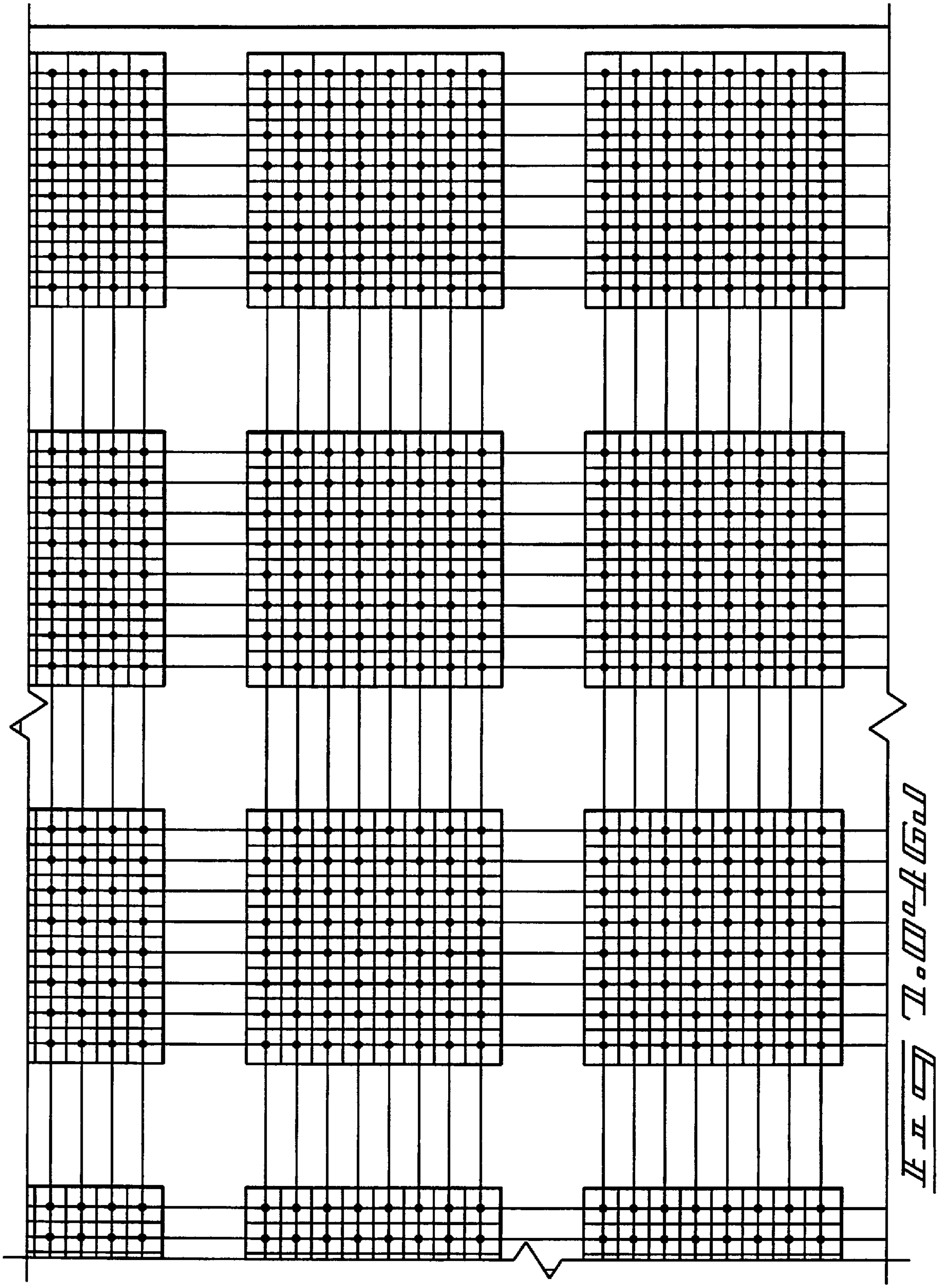
FIG. 7.04a

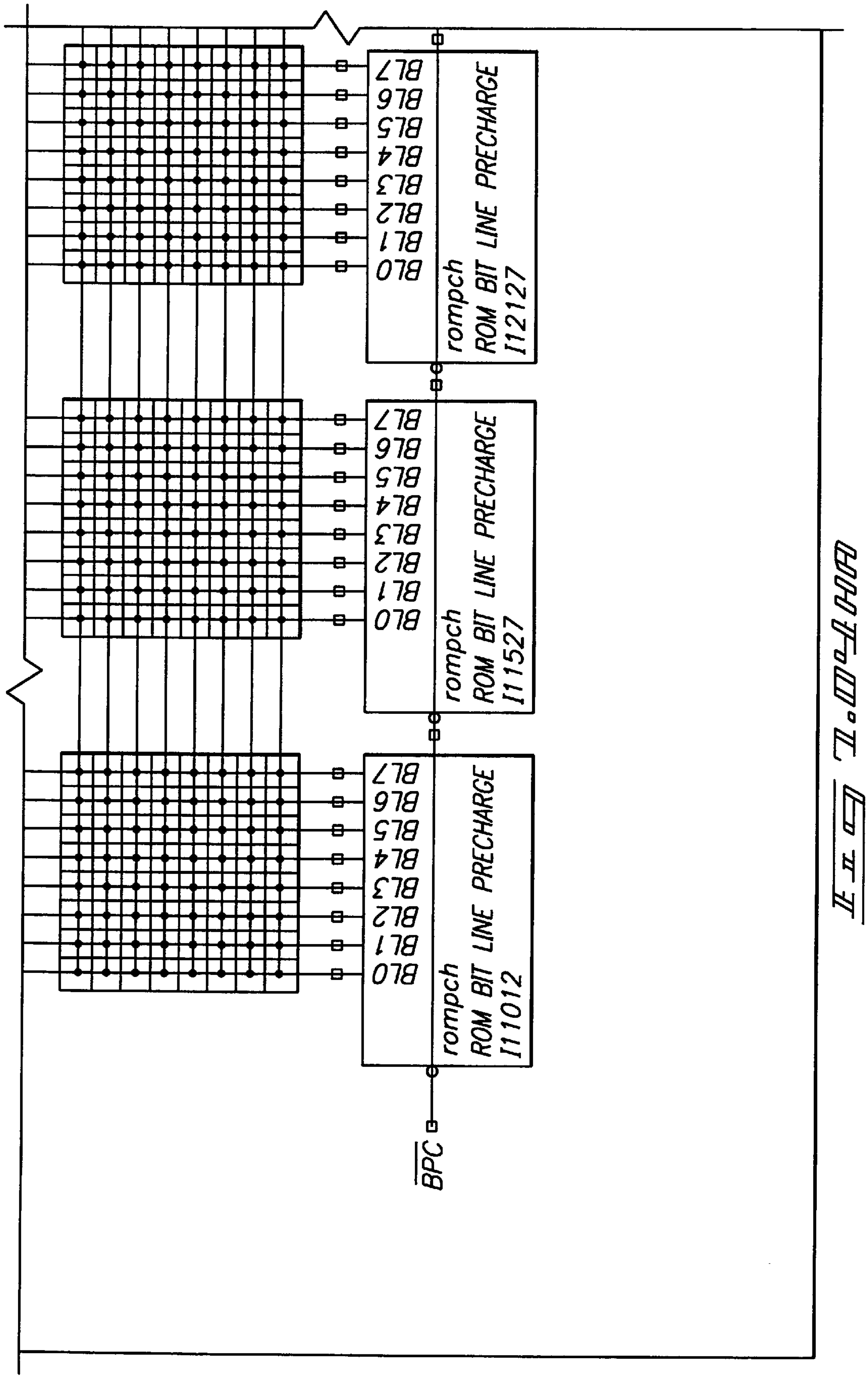
BL7
BL6
BL5
BL4
BL3
BL2
BL1
BL0
rompch
ROM BIT LINE PRECHARGE
I12127
BL7
BL6
BL5
BL4
BL3
BL2
BL1
BL0
rompch
ROM BIT LINE PRECHARGE
I11527
BL7
BL6
BL5
BL4
BL3
BL2
BL1
BL0
rompch
ROM BIT LINE PRECHARGE
I11012
BPC

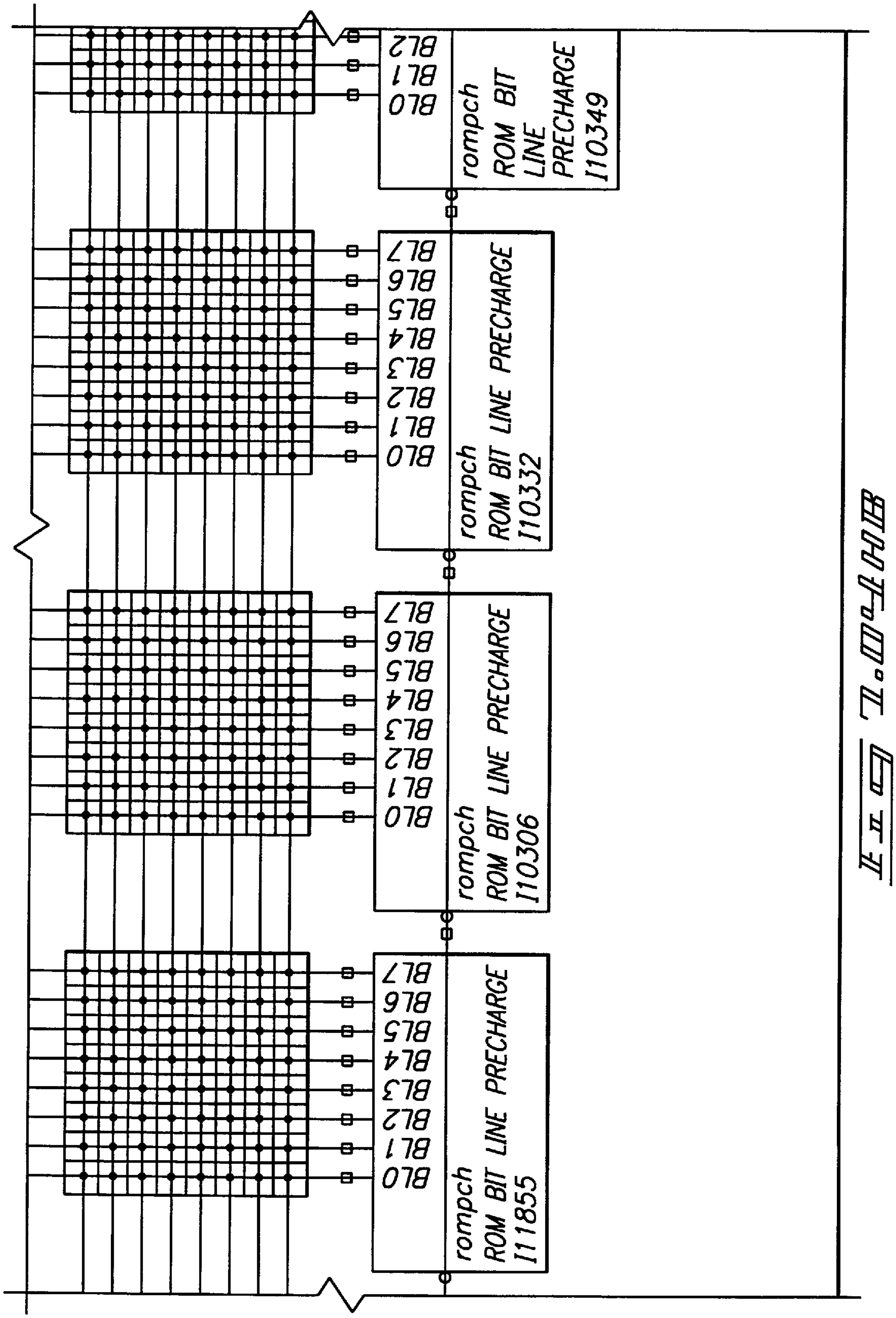
BL0
BL1
BL2
rompch
ROM BIT
LINE
PRECHARGE
I10349
BL0
BL1
BL2
BL3
BL4
BL5
BL6
BL7
rompch
ROM BIT LINE PRECHARGE
I10332
BL0
BL1
BL2
BL3
BL4
BL5
BL6
BL7
rompch
ROM BIT LINE PRECHARGE
I10306
BL0
BL1
BL2
BL3
BL4
BL5
BL6
BL7
rompch
ROM BIT LINE PRECHARGE
I11855

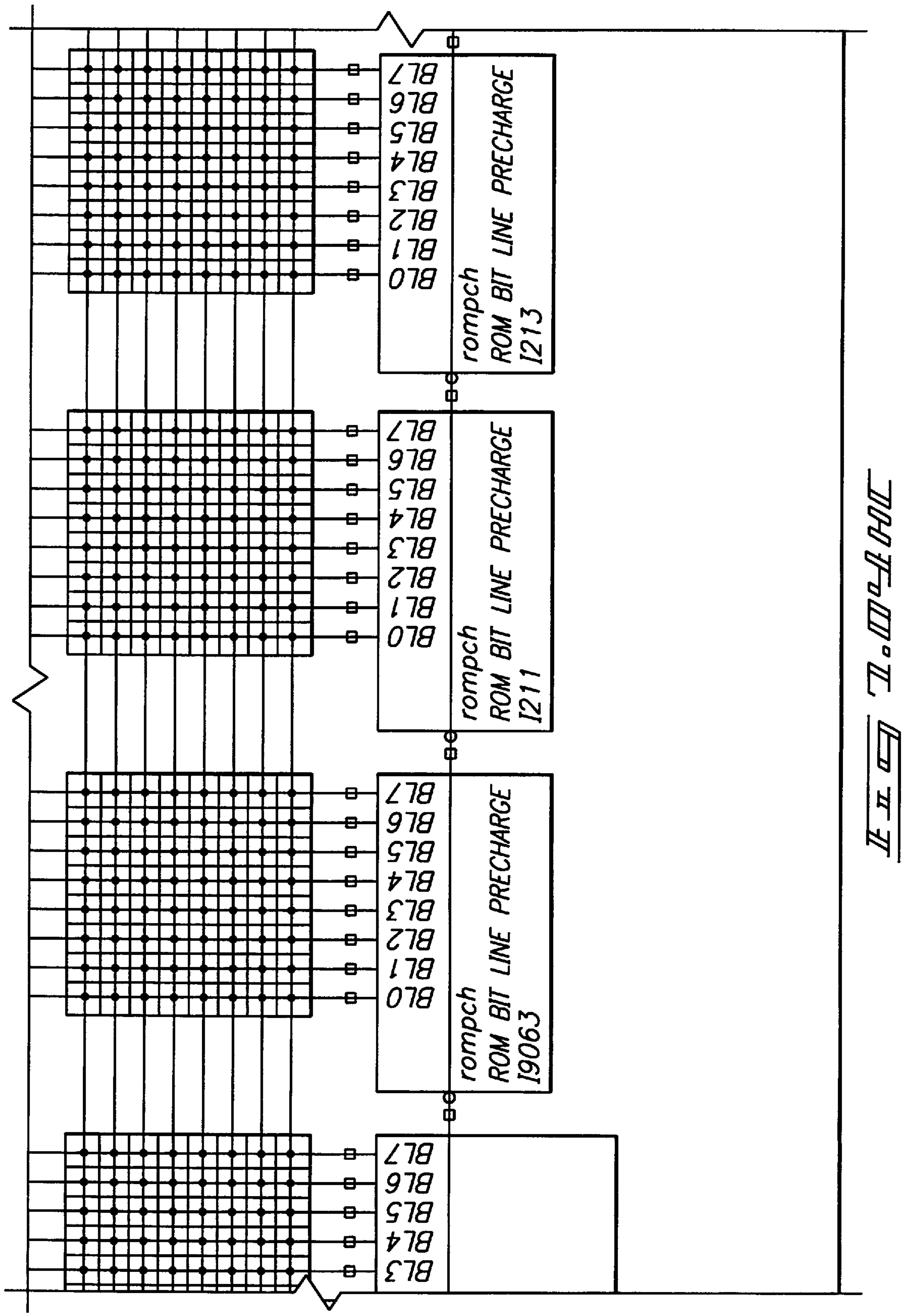
Fig. 7.04HH

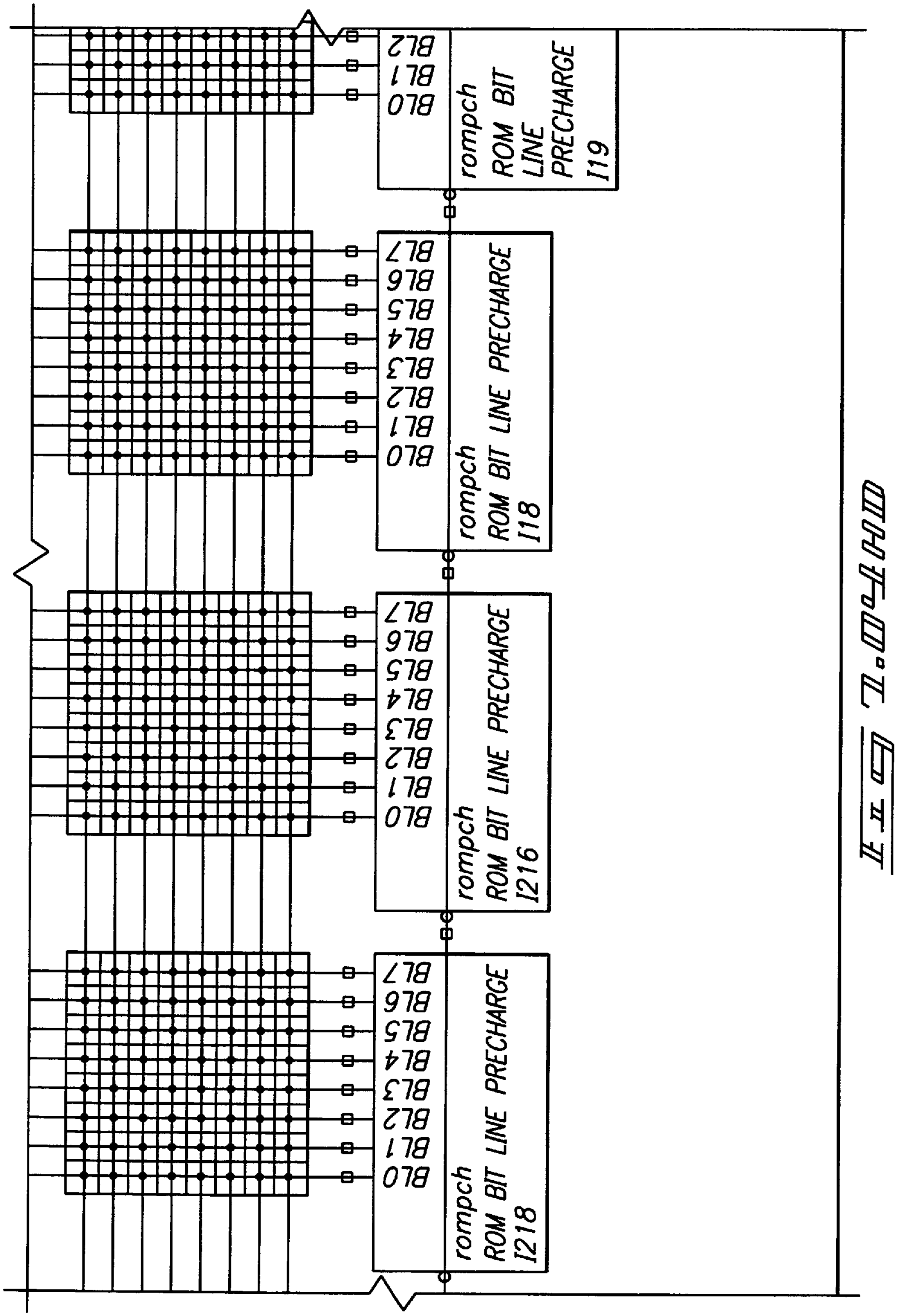
BL2
BL1
BL0
rompch
ROM BIT
LINE
PRECHARGE
I19
BL7
BL6
BL5
BL4
BL3
BL2
BL1
BL0
rompch
ROM BIT LINE PRECHARGE
I18
BL7
BL6
BL5
BL4
BL3
BL2
BL1
BL0
rompch
ROM BIT LINE PRECHARGE
I216
BL7
BL6
BL5
BL4
BL3
BL2
BL1
BL0
rompch
ROM BIT LINE PRECHARGE
I218

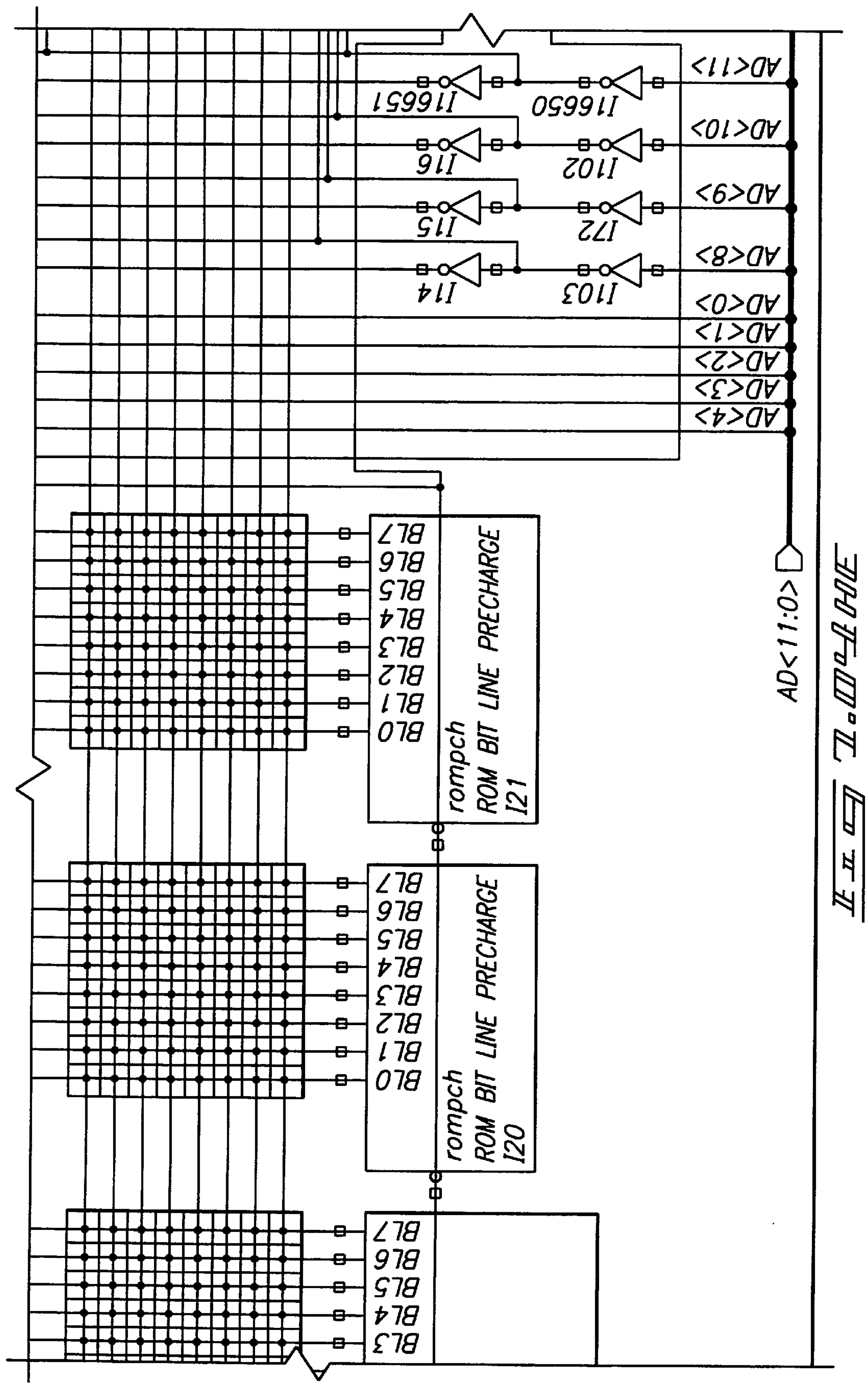
FIG. 7.04AE

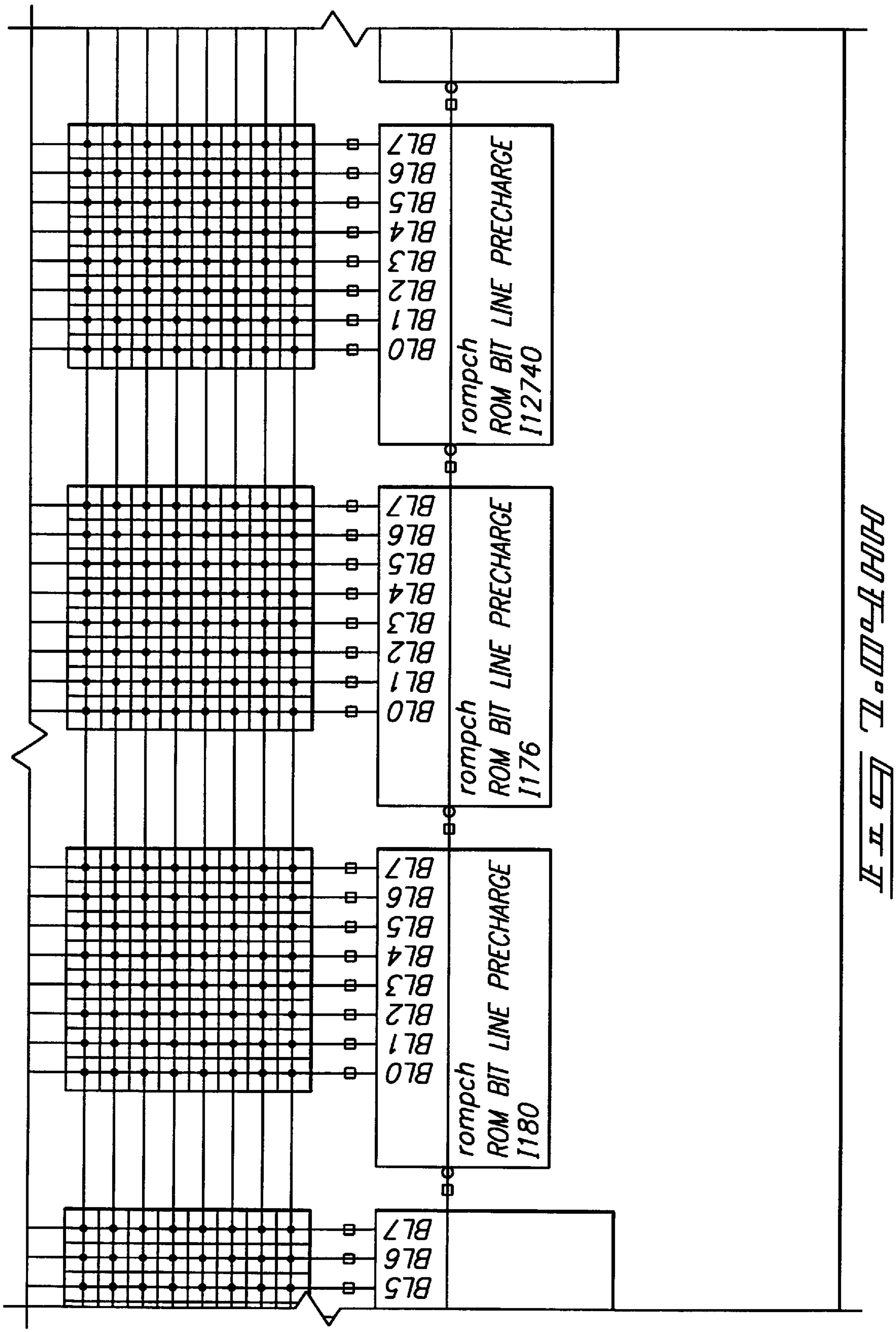
Fig. 7.0HHHH

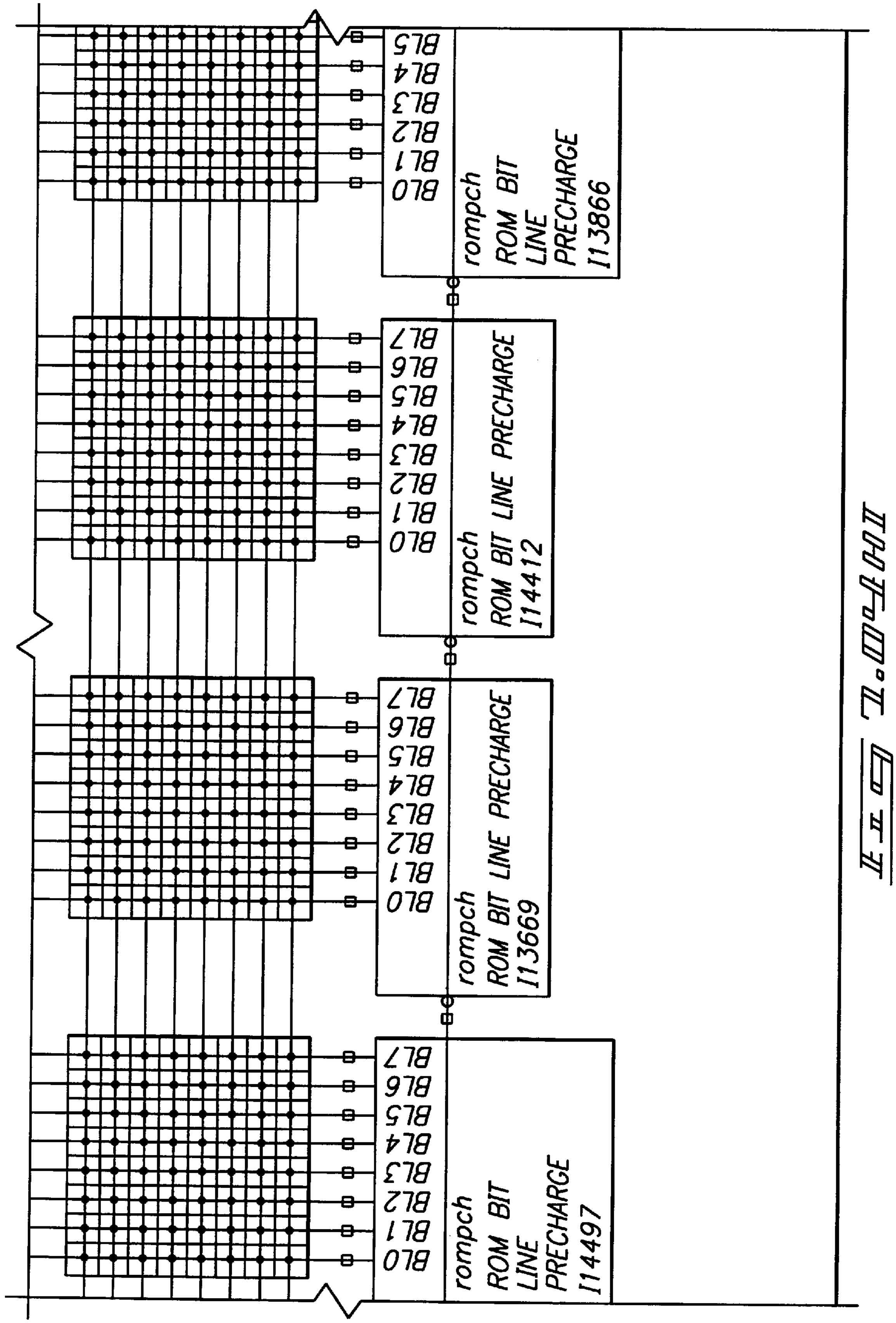
BL5
BL4
BL3
BL2
BL1
BL0
rompch
ROM BIT
LINE
PRECHARGE
I13866
BL7
BL6
BL5
BL4
BL3
BL2
BL1
BL0
rompch
ROM BIT LINE PRECHARGE
I14412
BL7
BL6
BL5
BL4
BL3
BL2
BL1
BL0
rompch
ROM BIT LINE PRECHARGE
I13669
BL7
BL6
BL5
BL4
BL3
BL2
BL1
BL0
rompch
ROM BIT
LINE
PRECHARGE
I14497

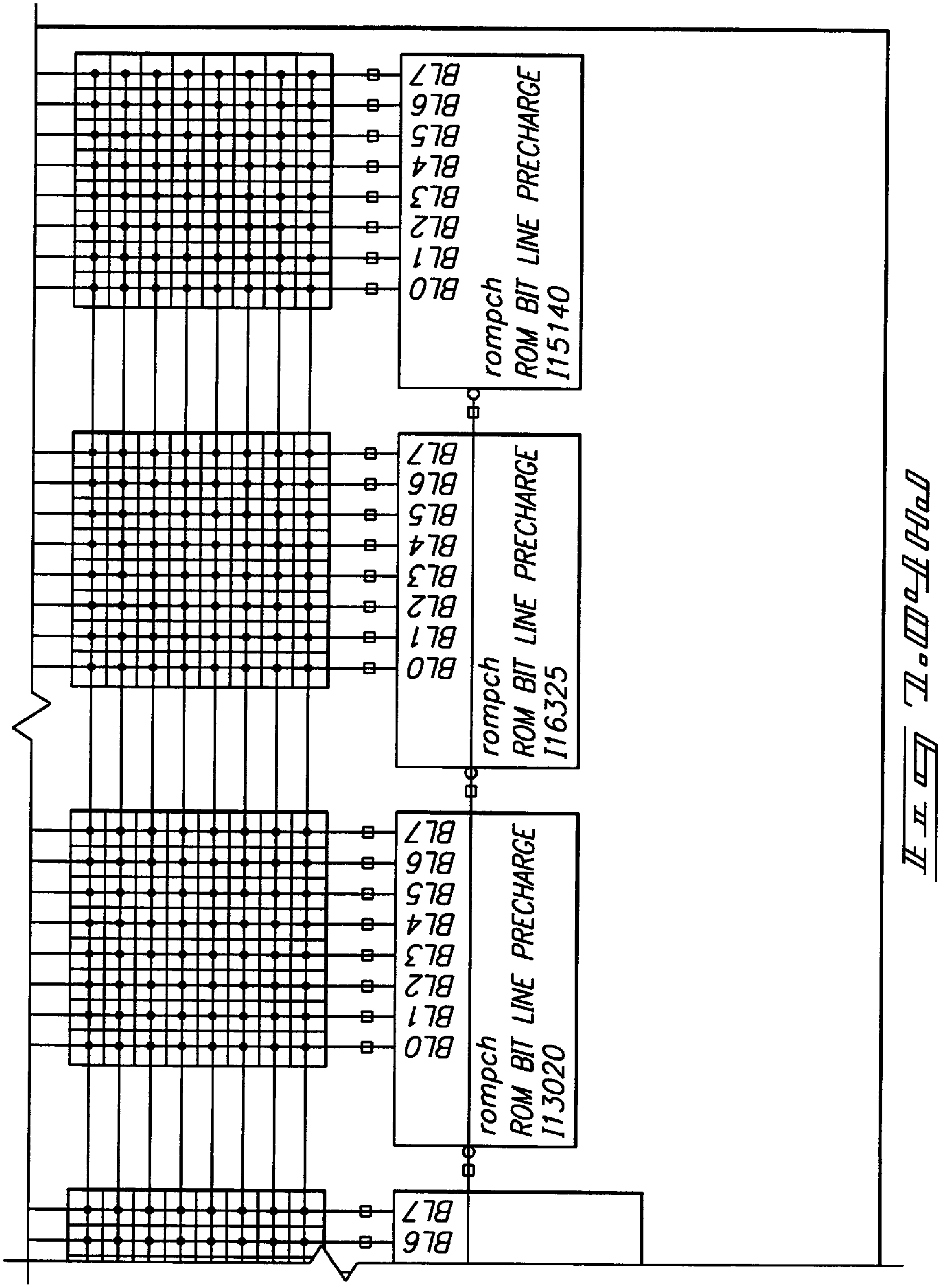
Fig. 6L.D.T.H.A

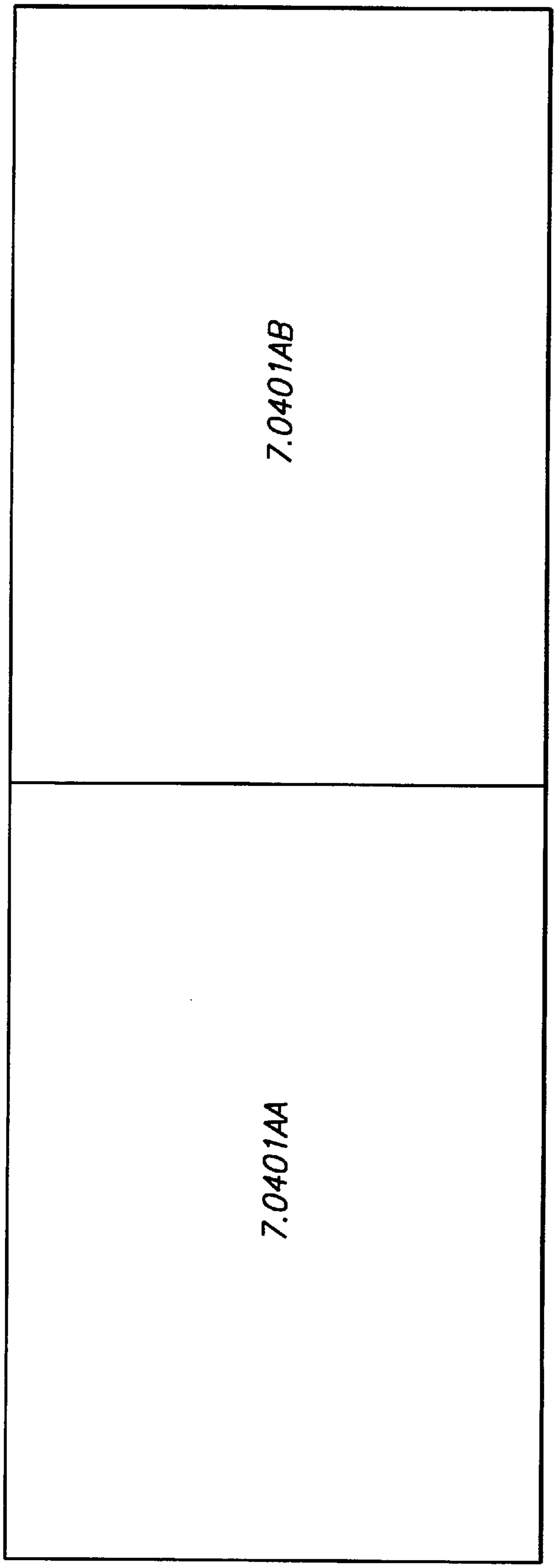
FIG. 7.0401

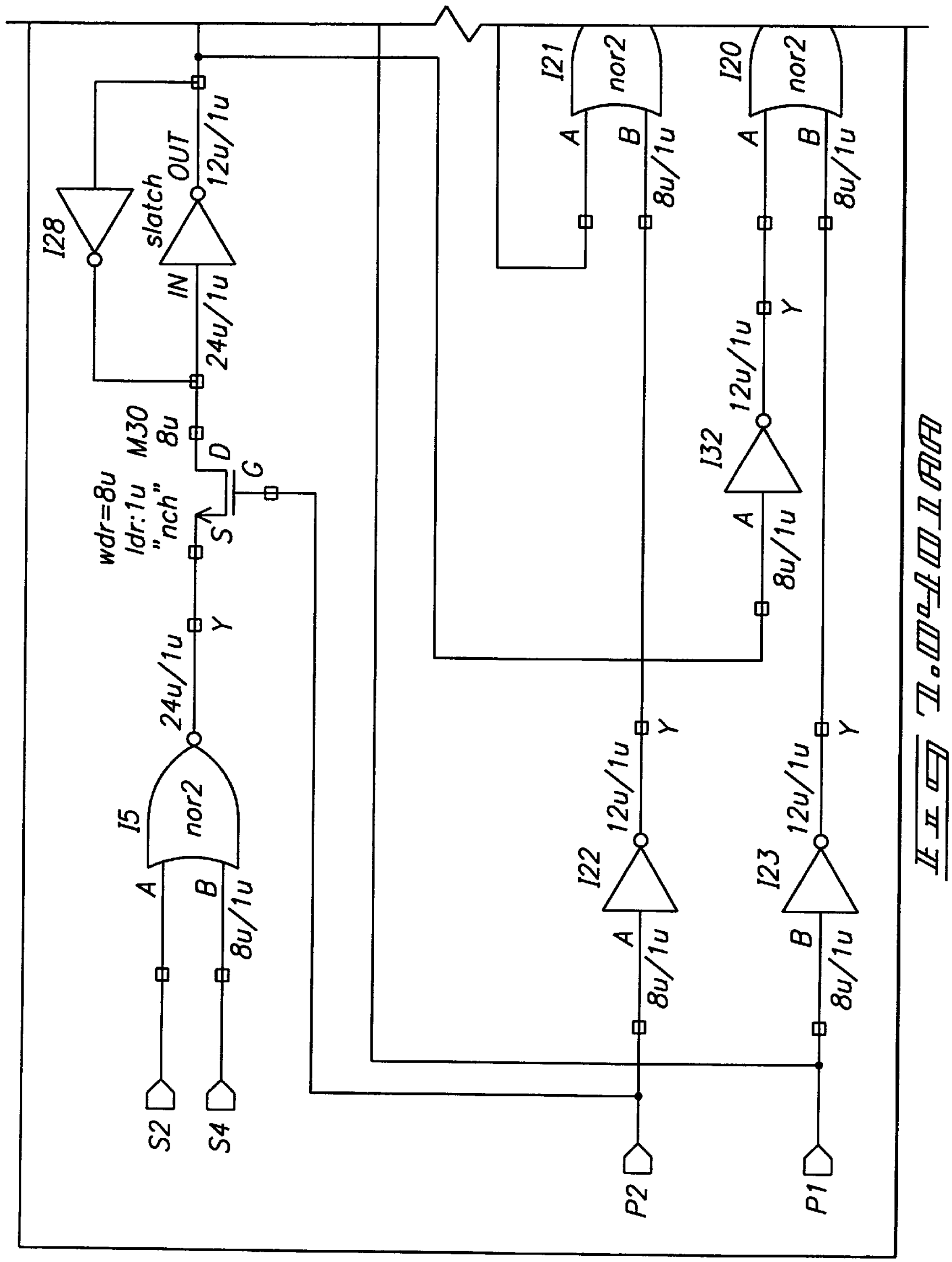
FIG. 7.04.01AA

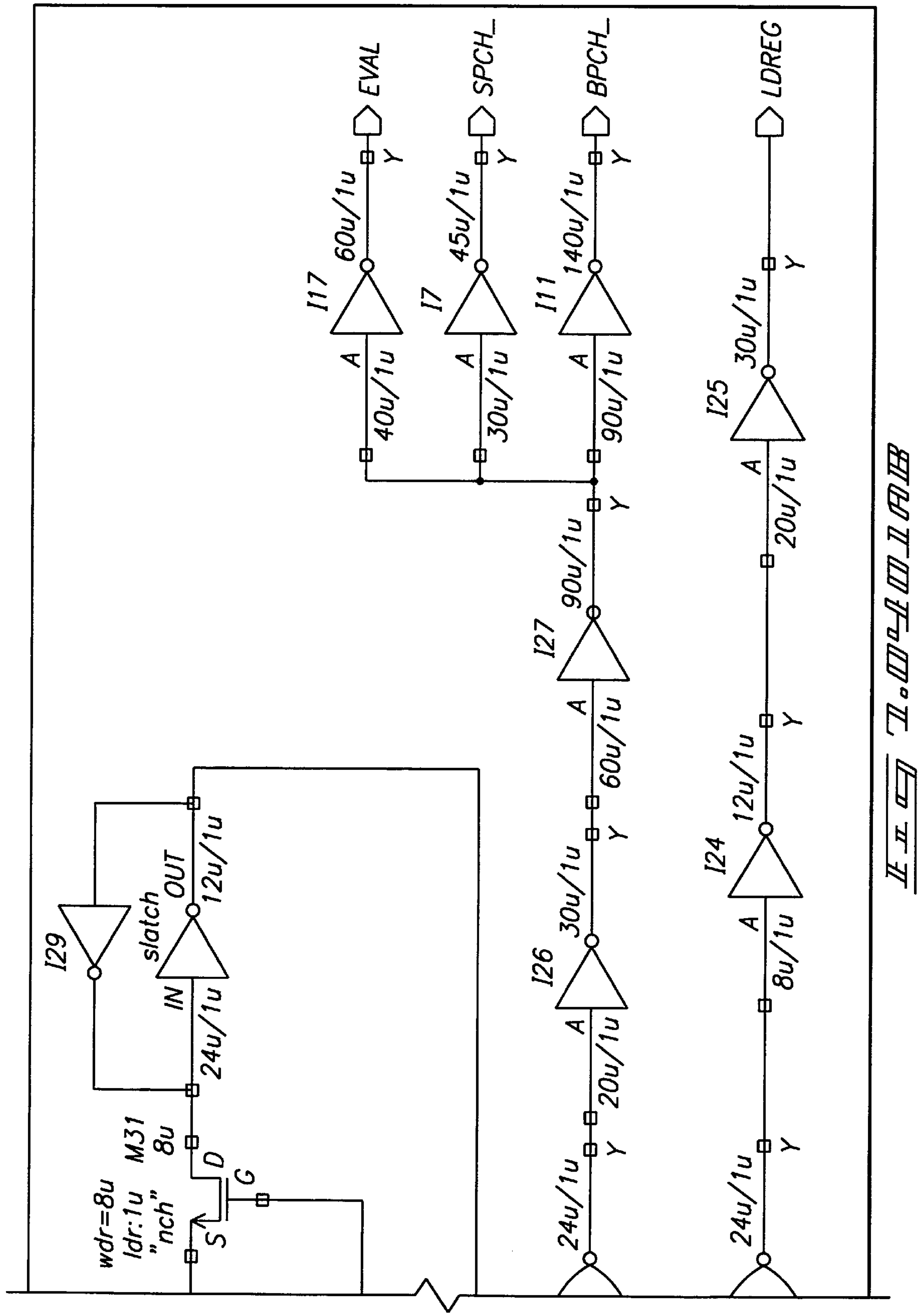
FIG. 7.004AB

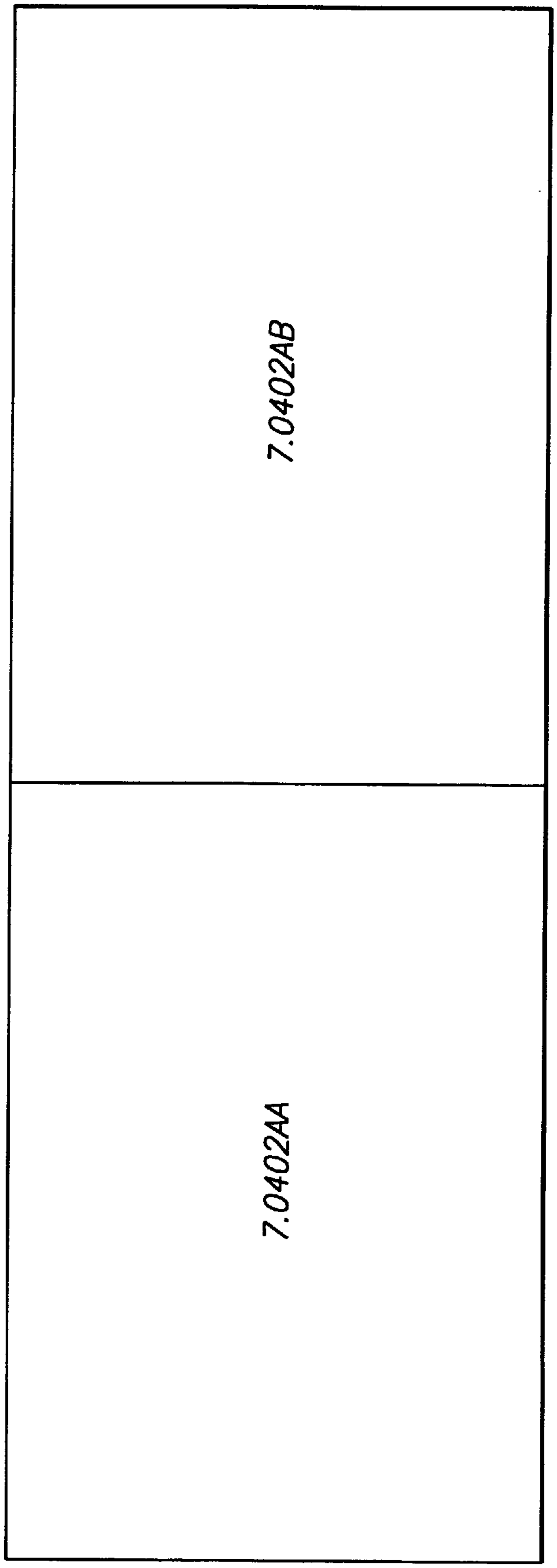
FIG. 7.0402

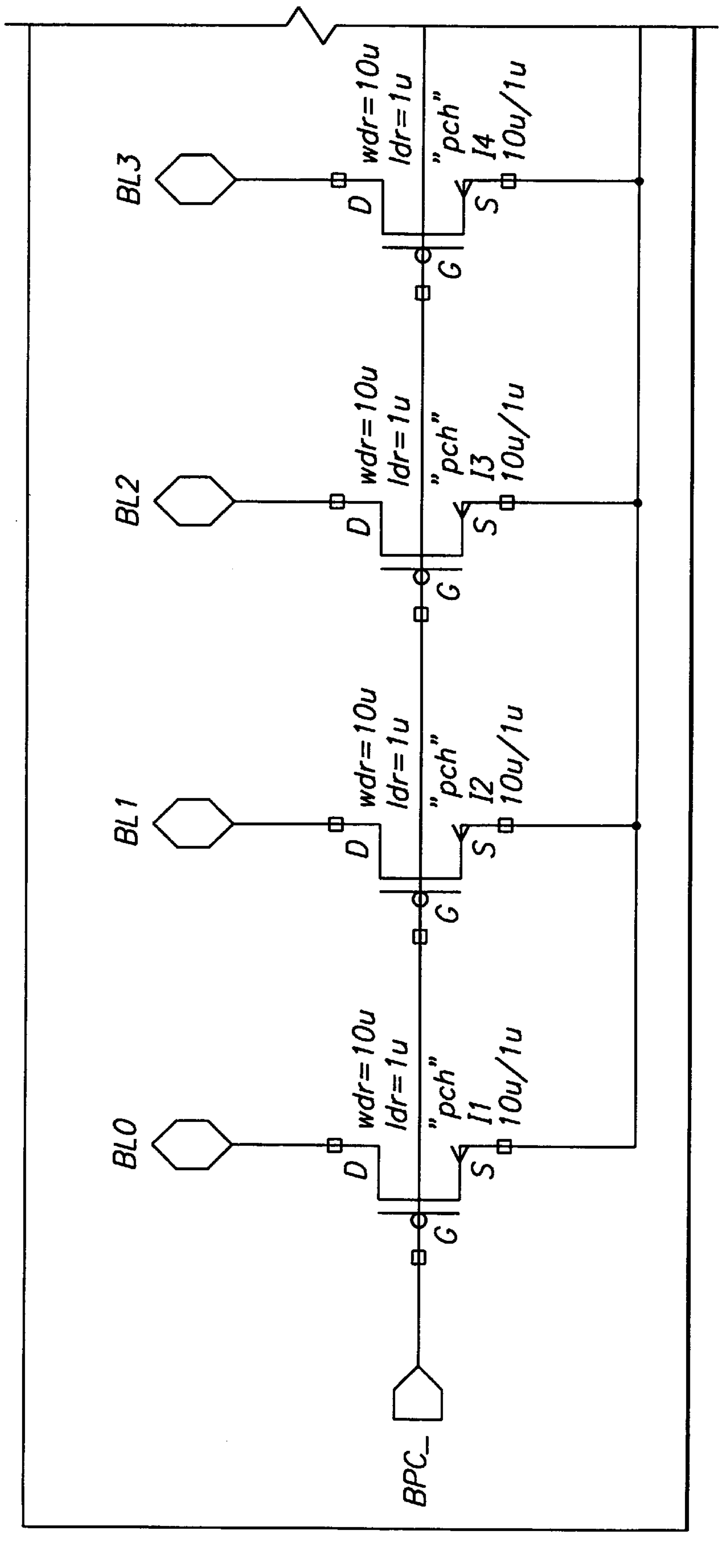
FIG. 7.04.02AA

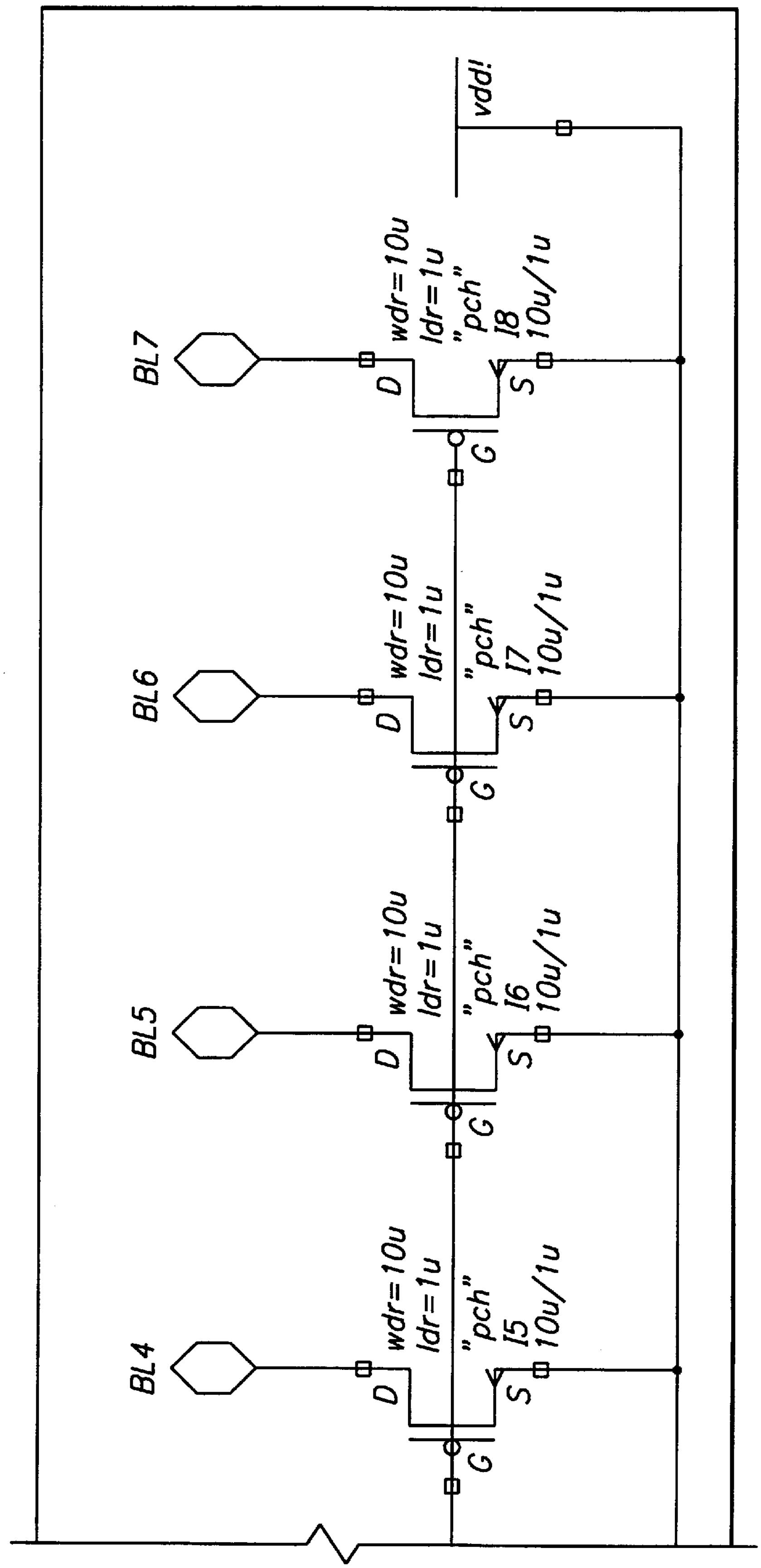
FIG. 7.04.02AB

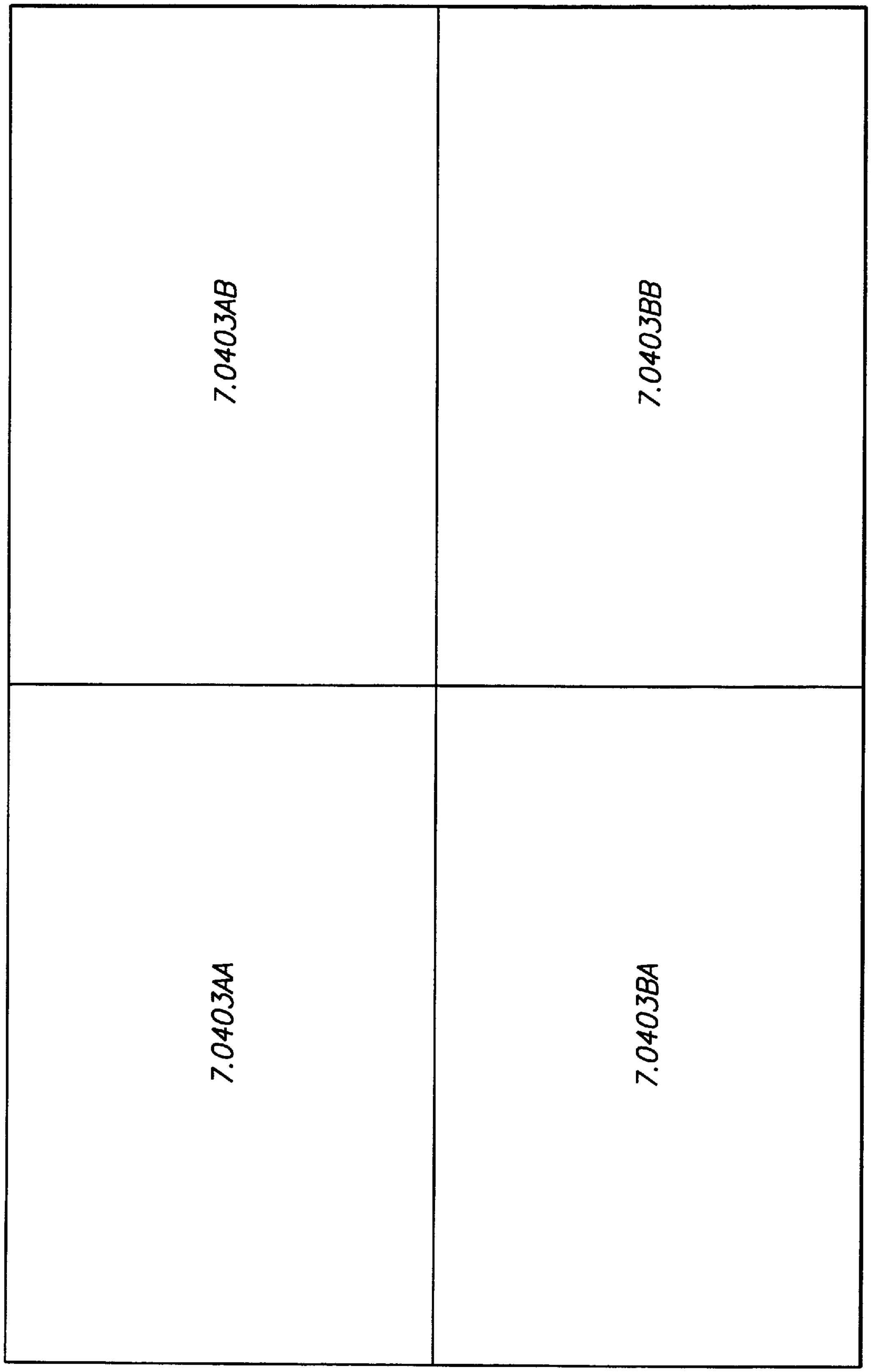
FIG. 7.0403

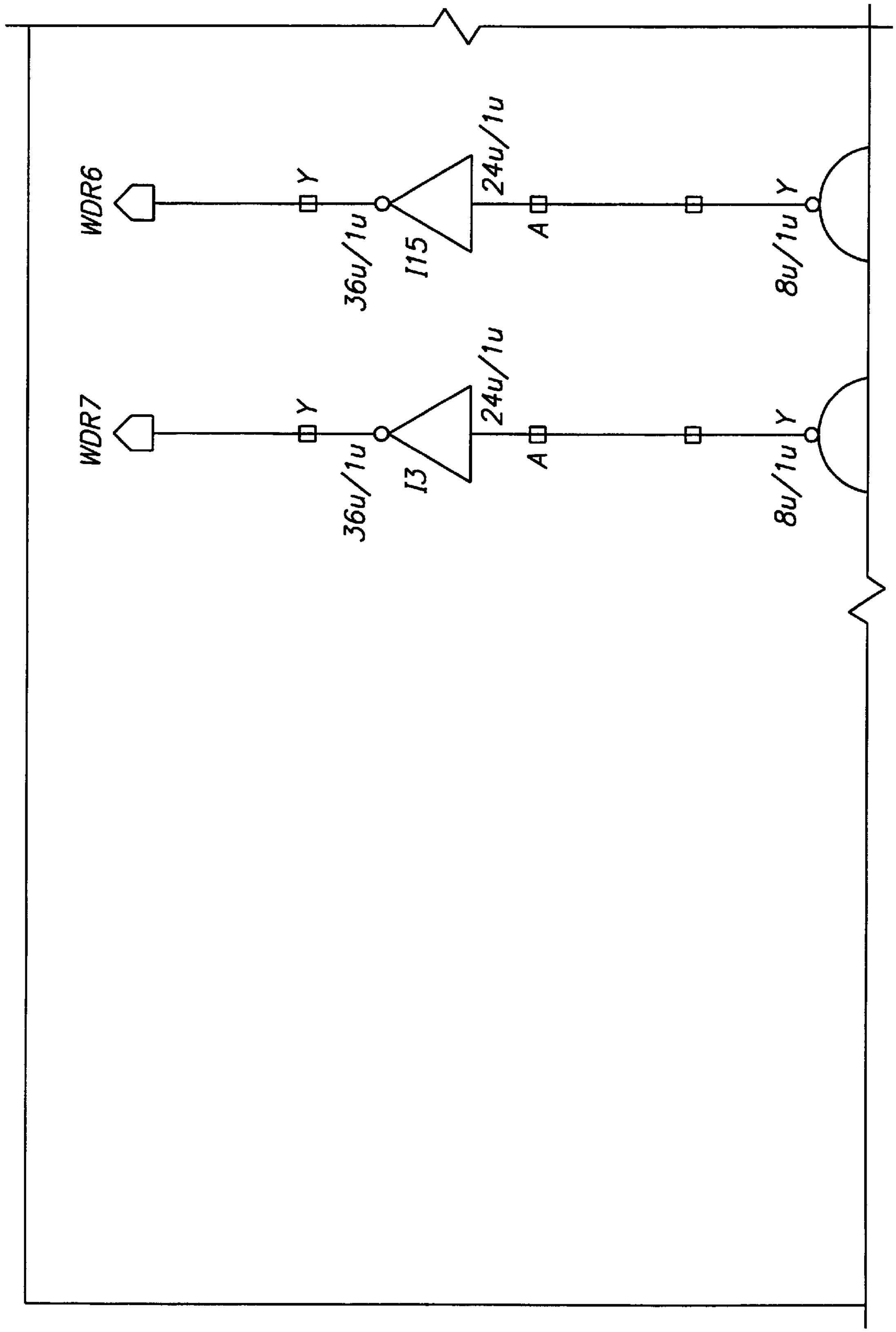
FIG. 7.04103AA

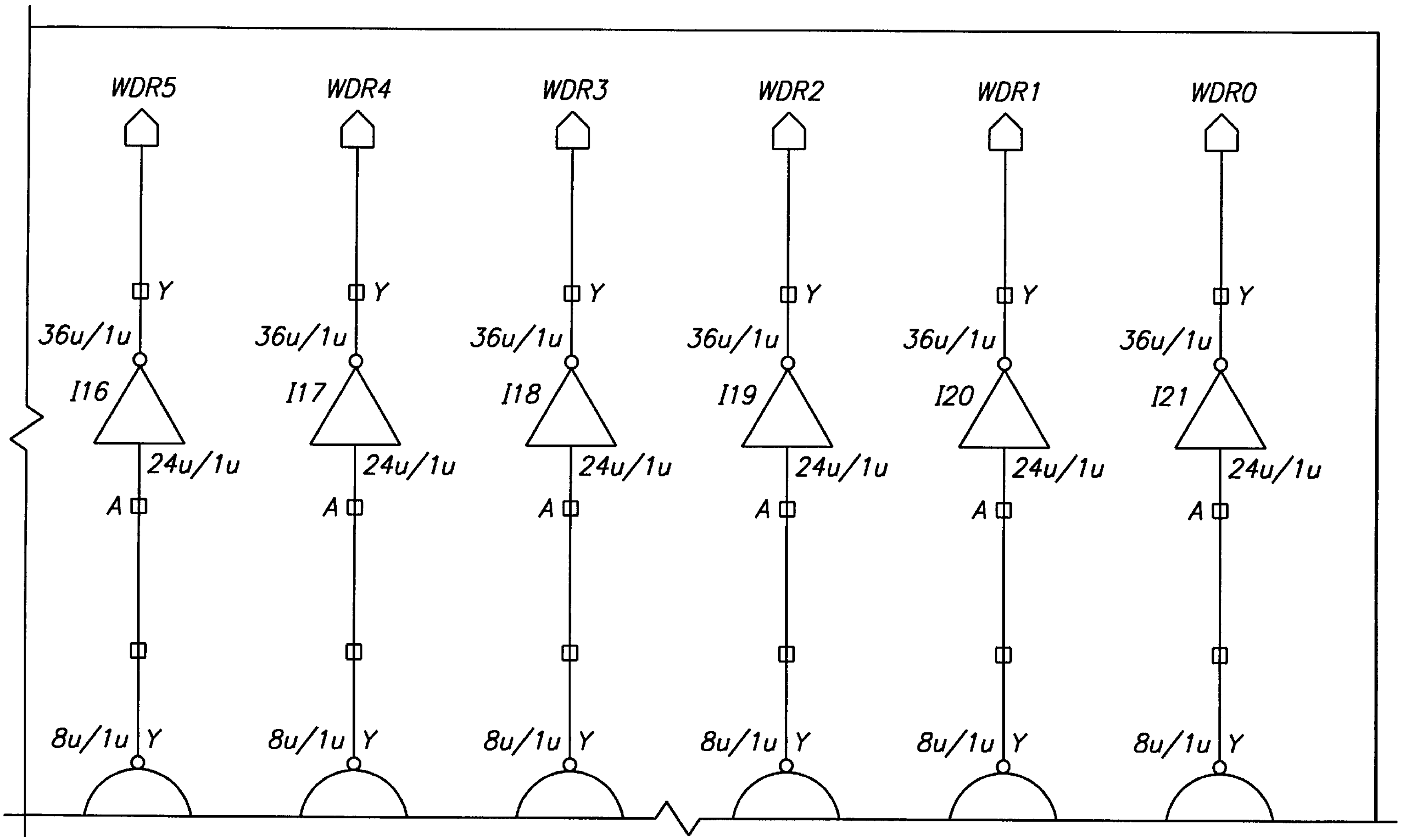
FIG. 7.0403AB

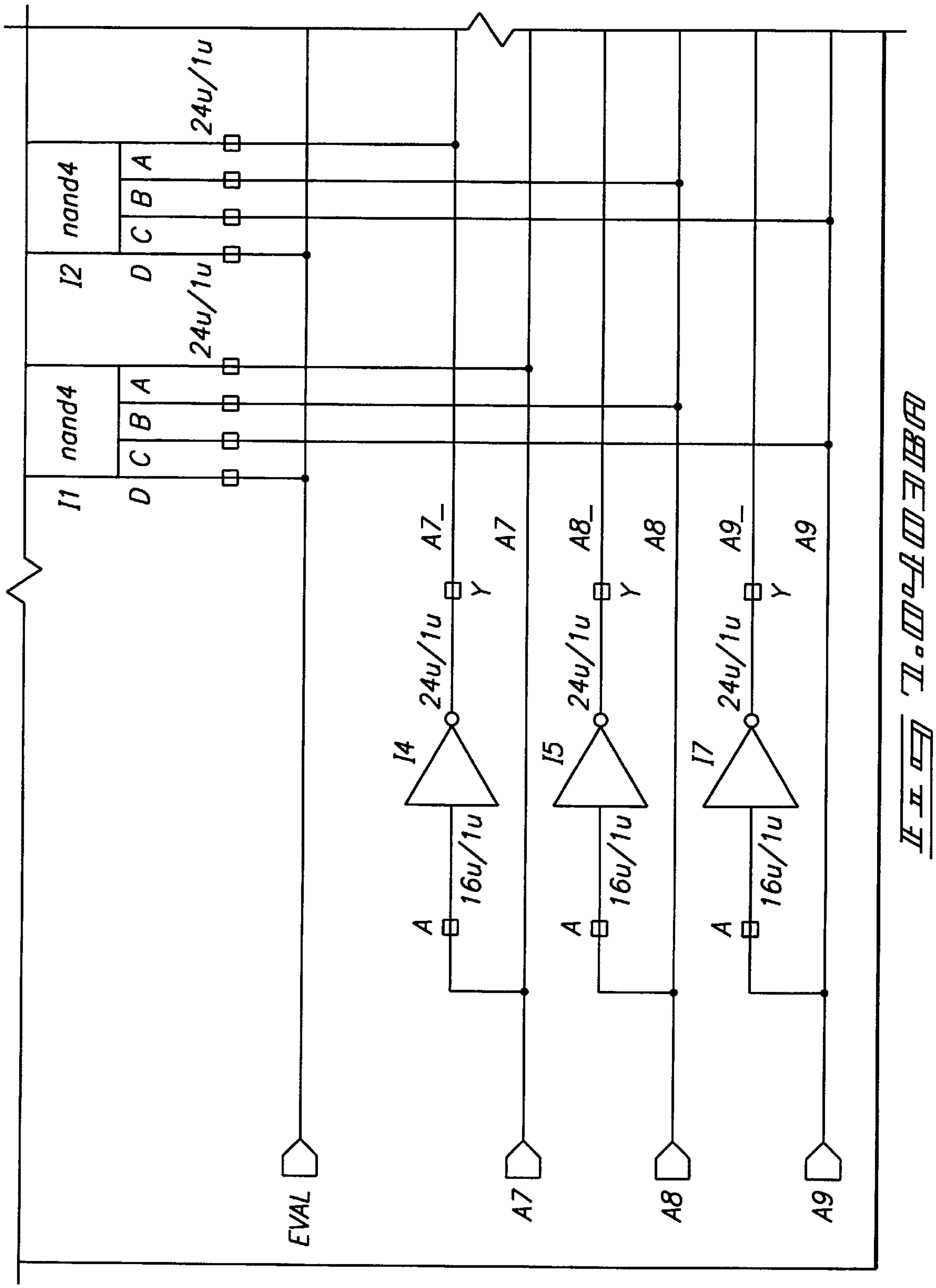
FIG. 7.0.7.0.3.B.A

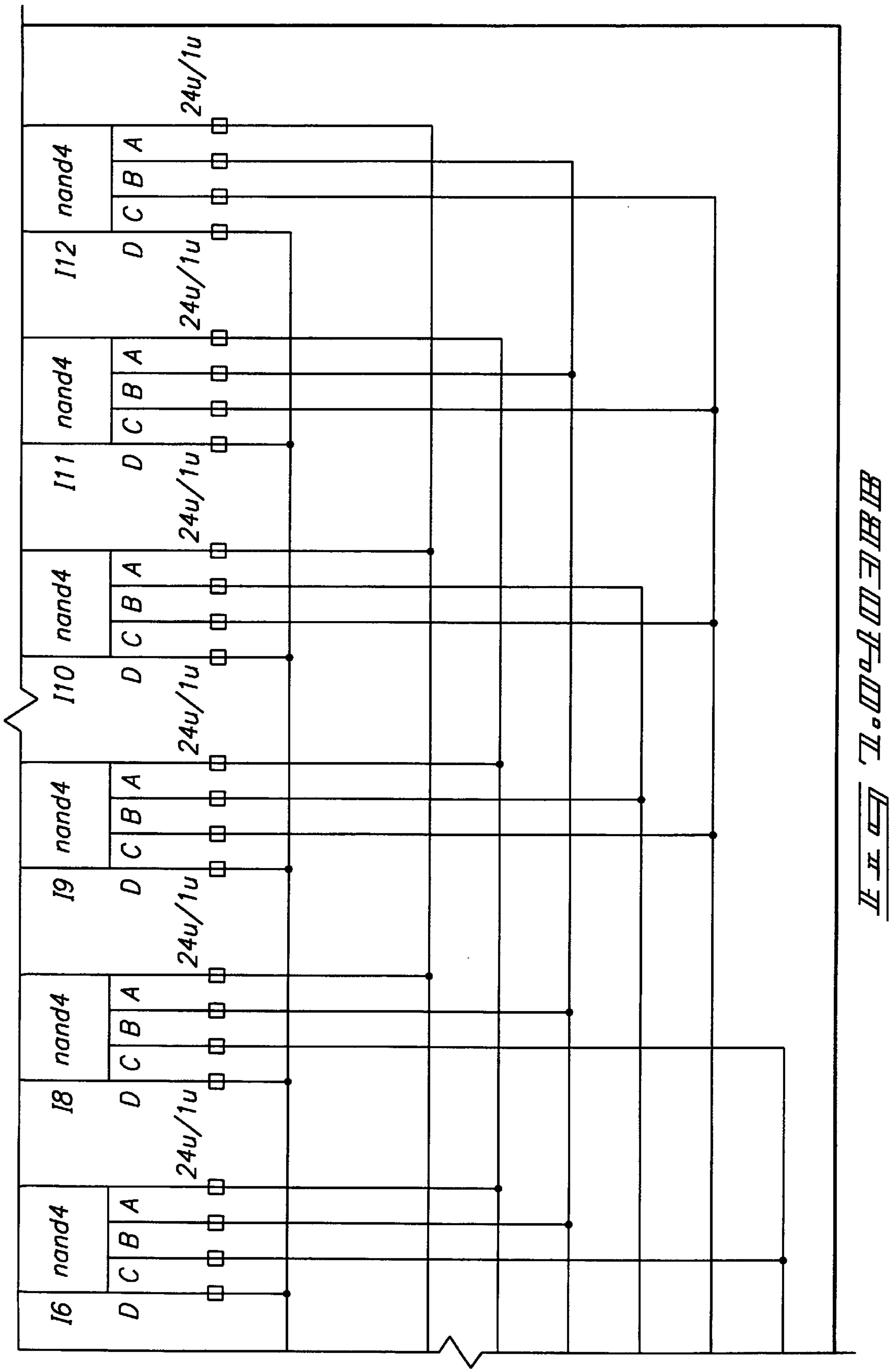
FIG. 7.040EBB

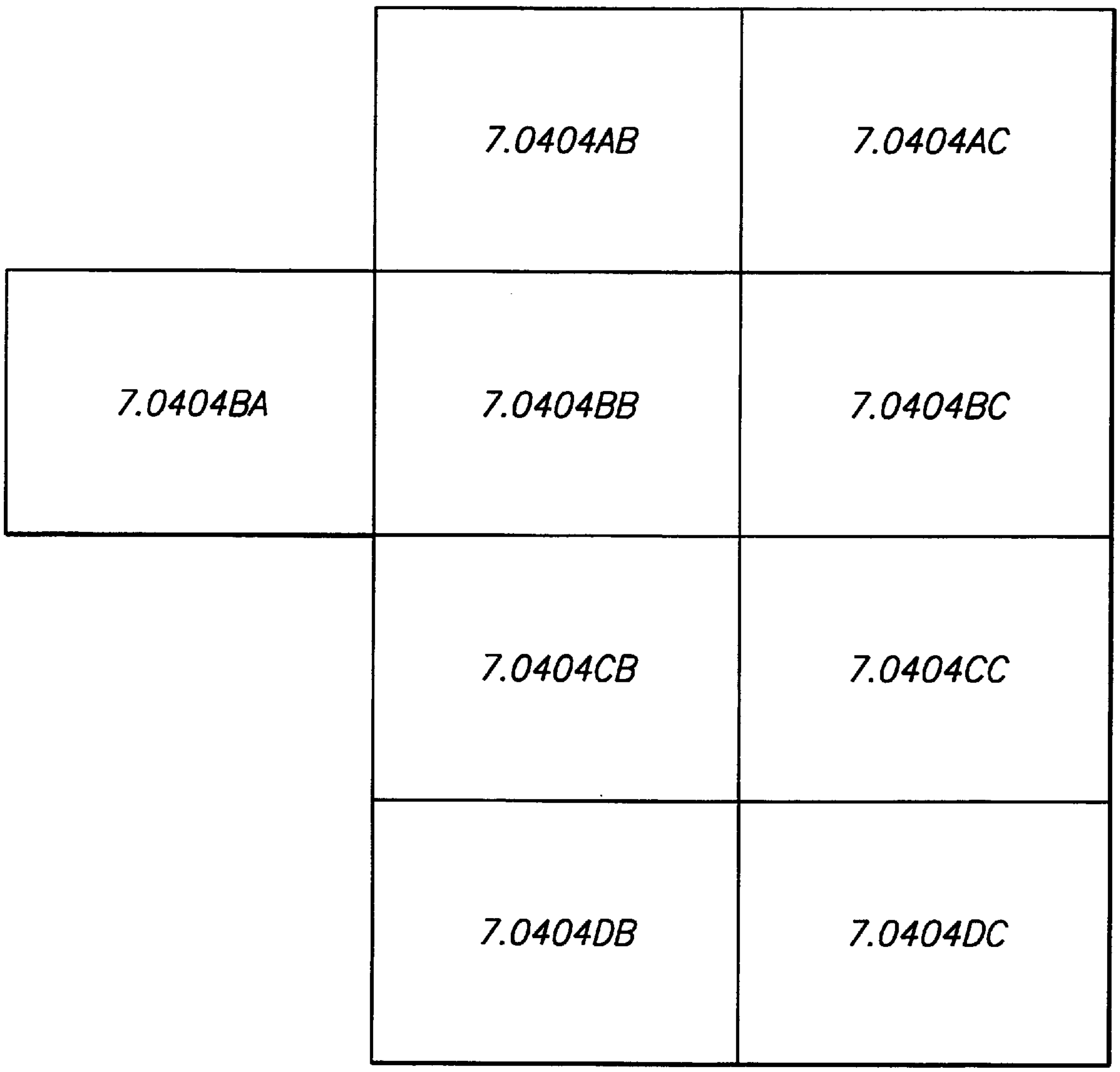
Fig 7.0404

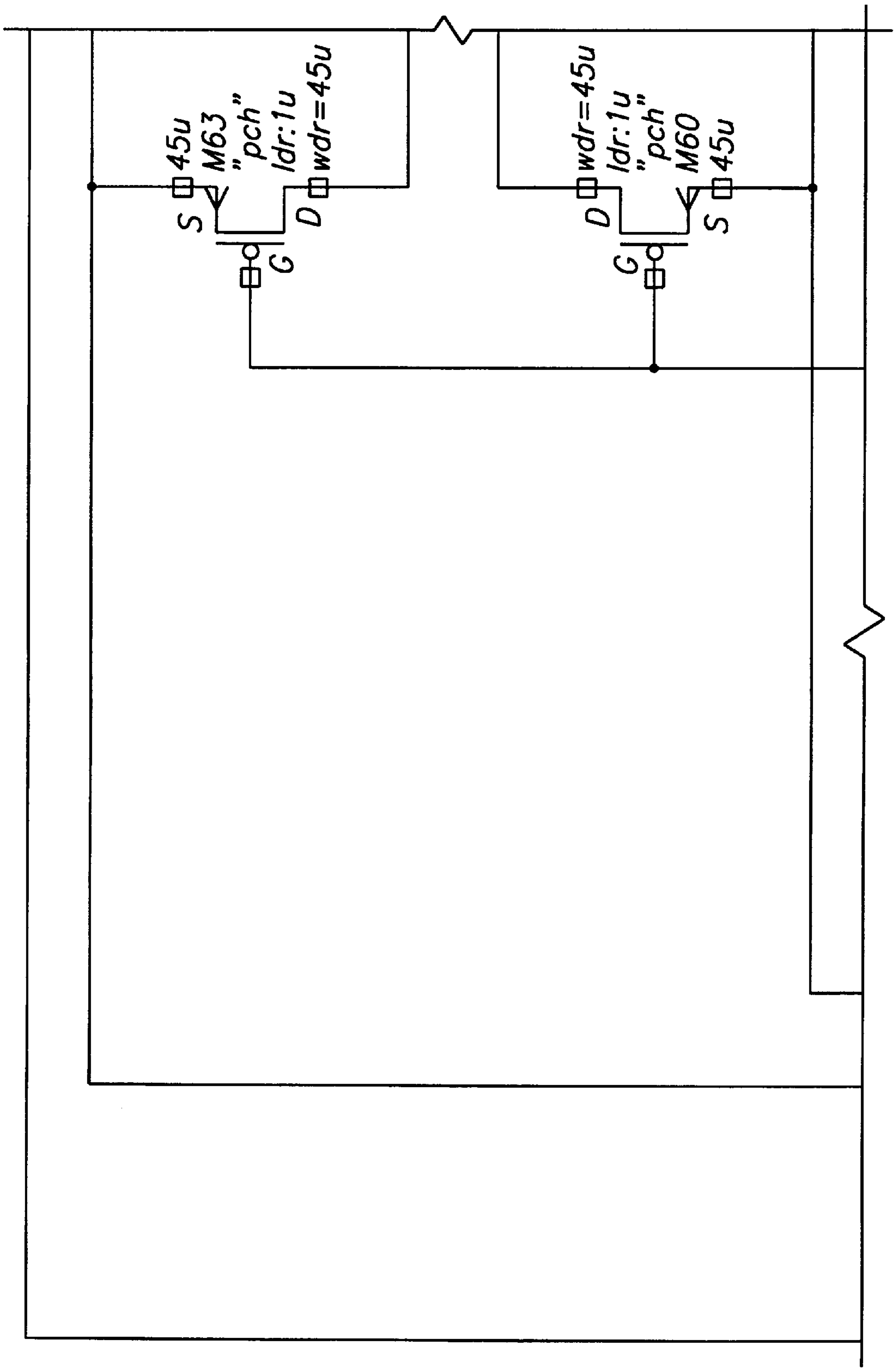
FIG. 7.01.01.4B

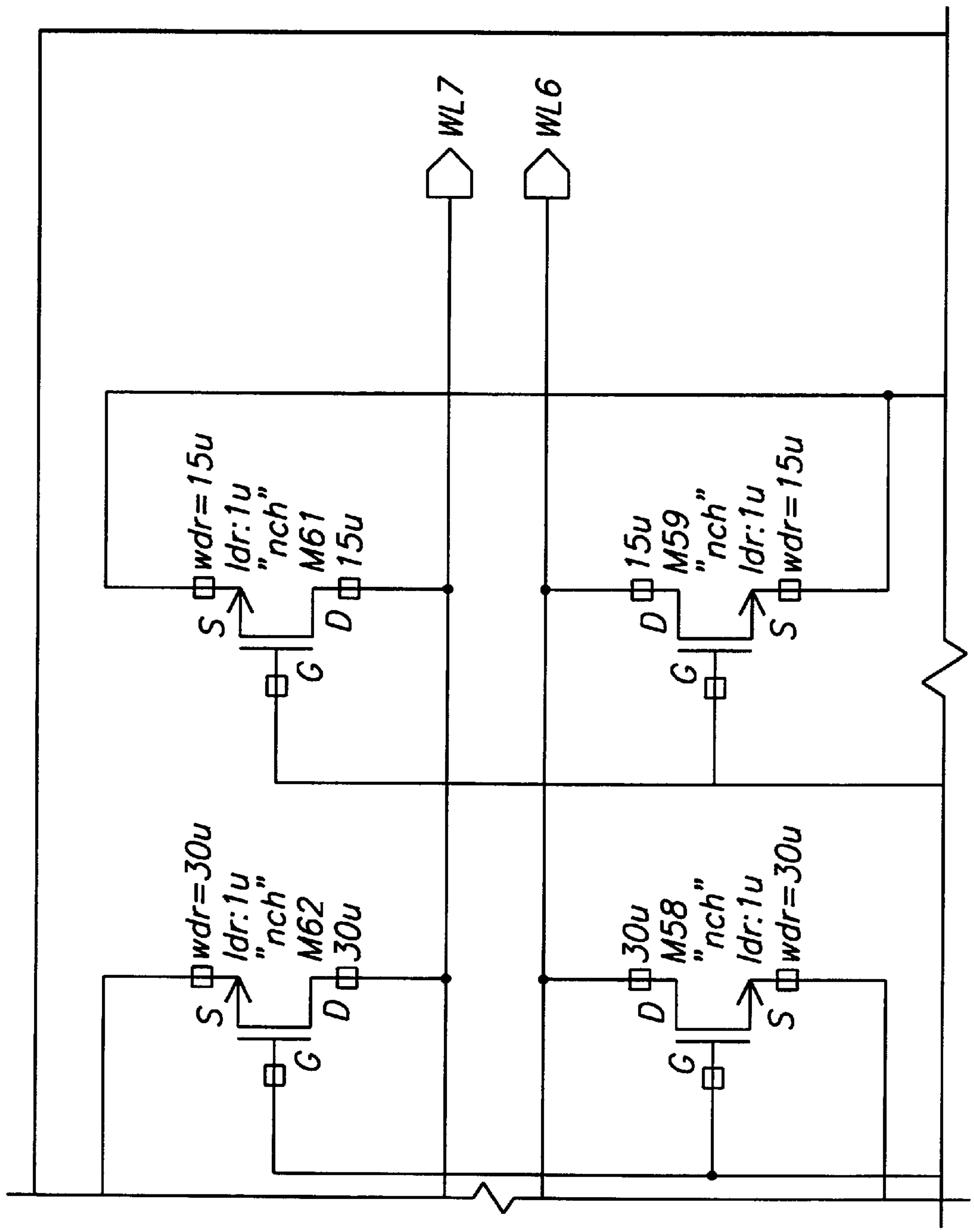
Fig. 7.0.7.0.7AC

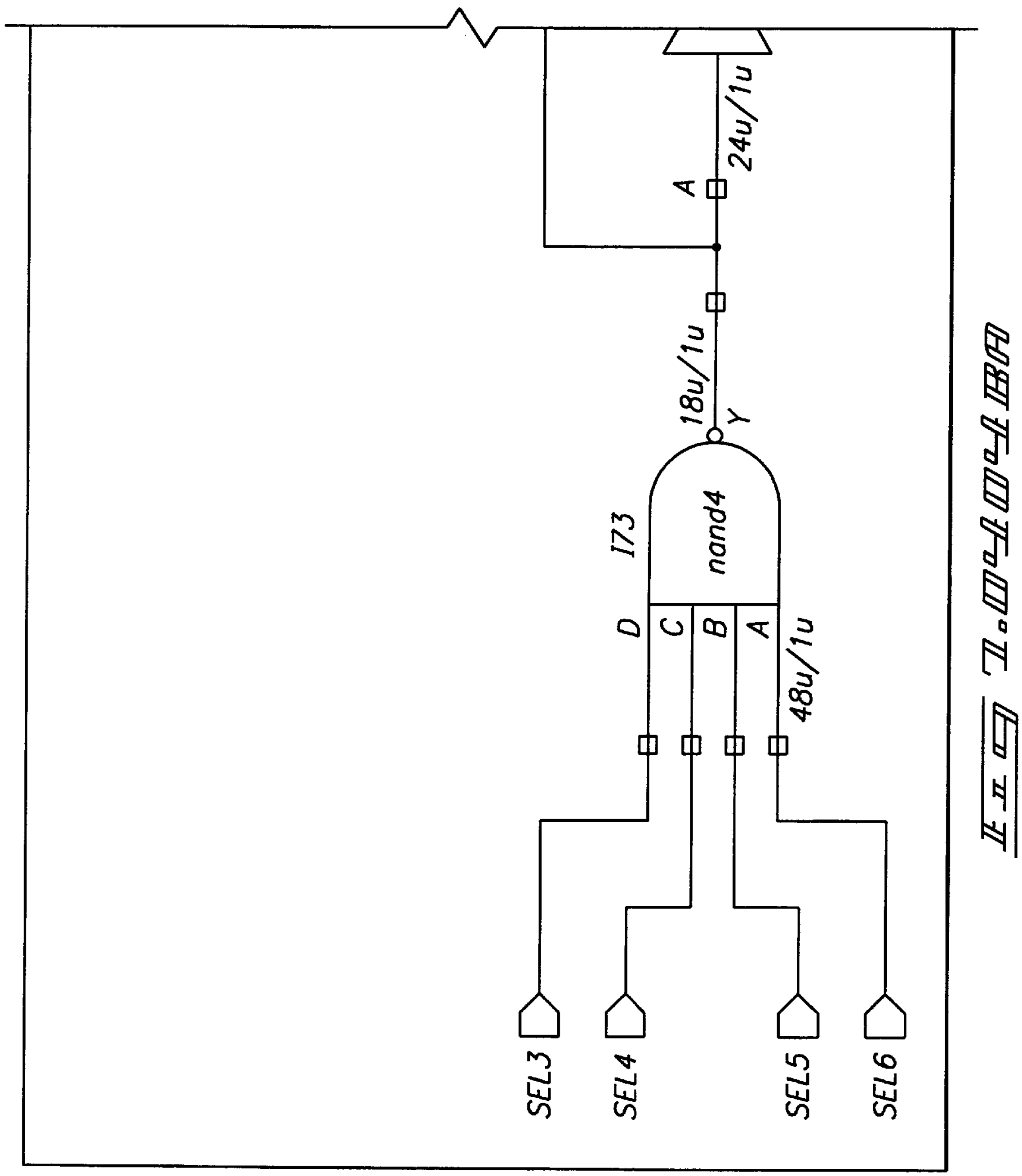
FIG. 7.0404BA

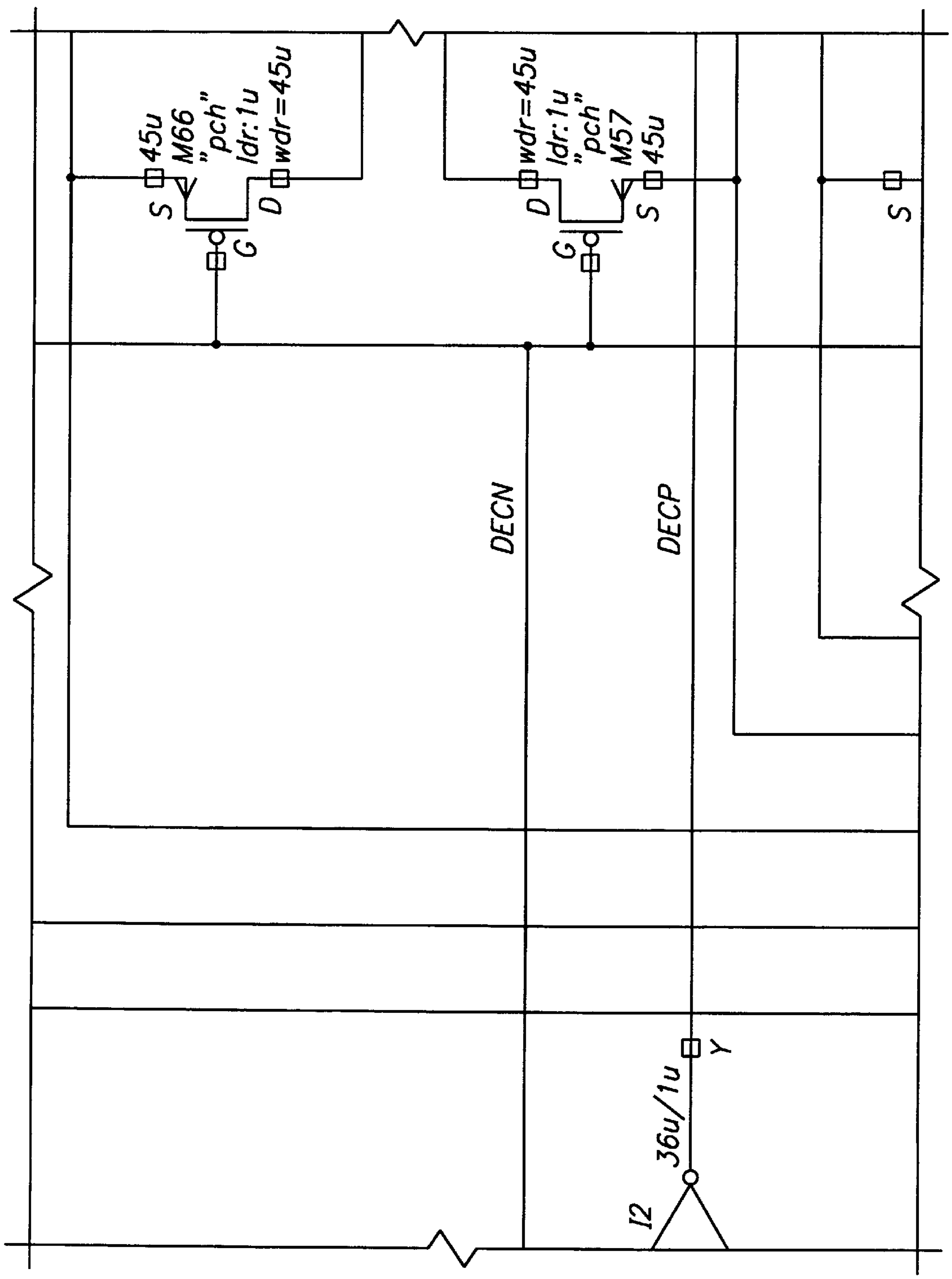
FIG. 7.0404BB

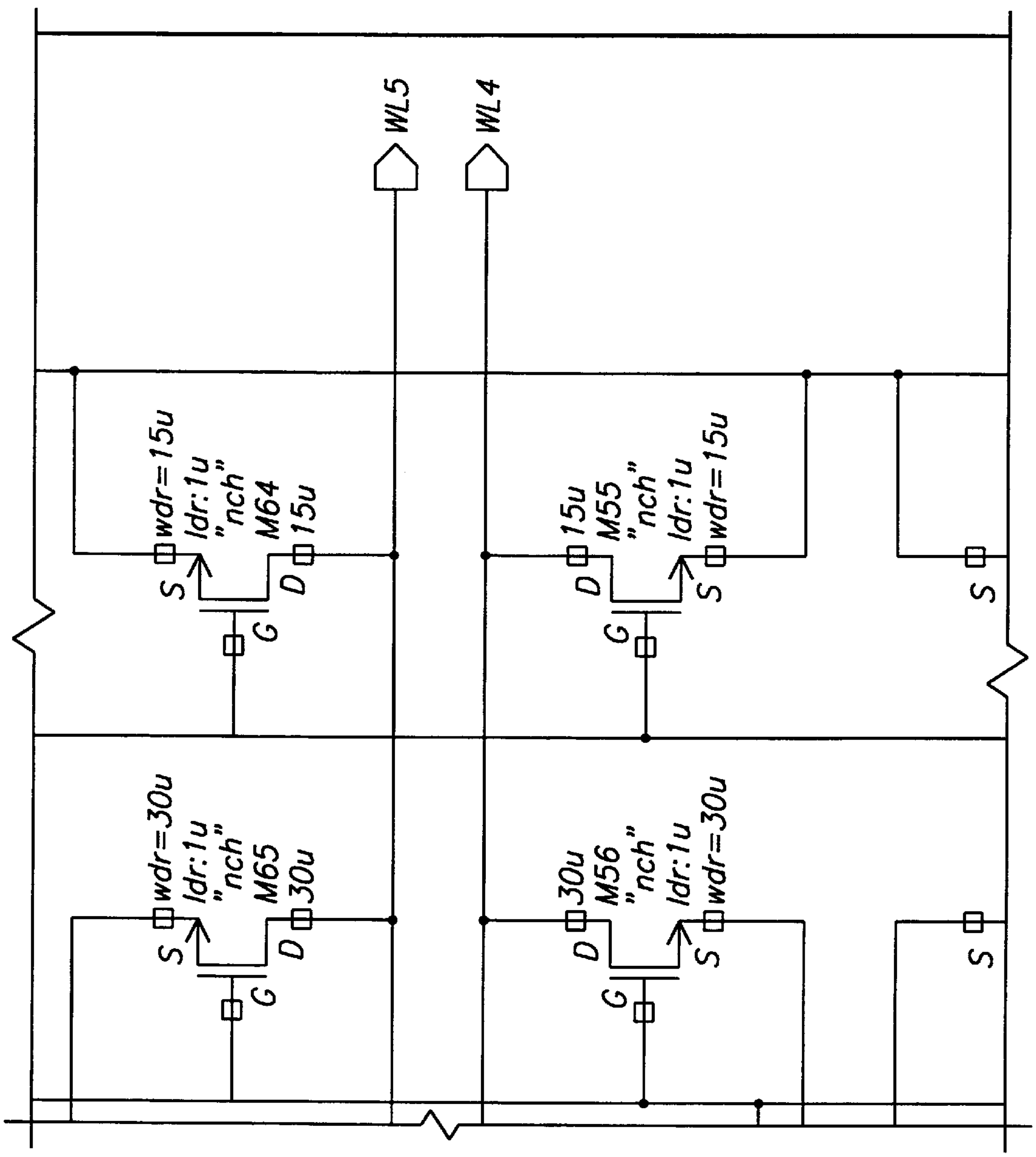
FIG. 7.04.04.BC

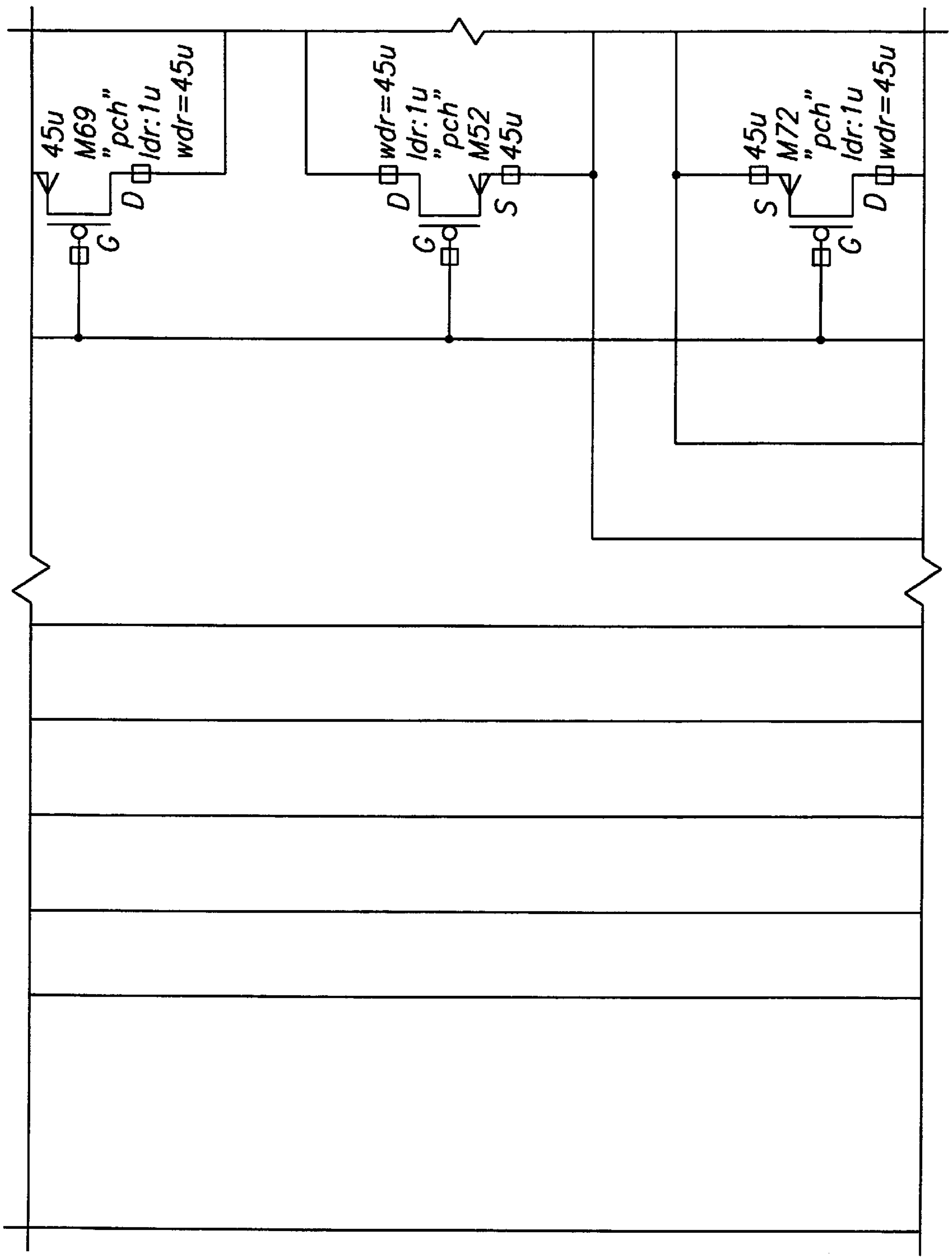
FIG. 7.04041B

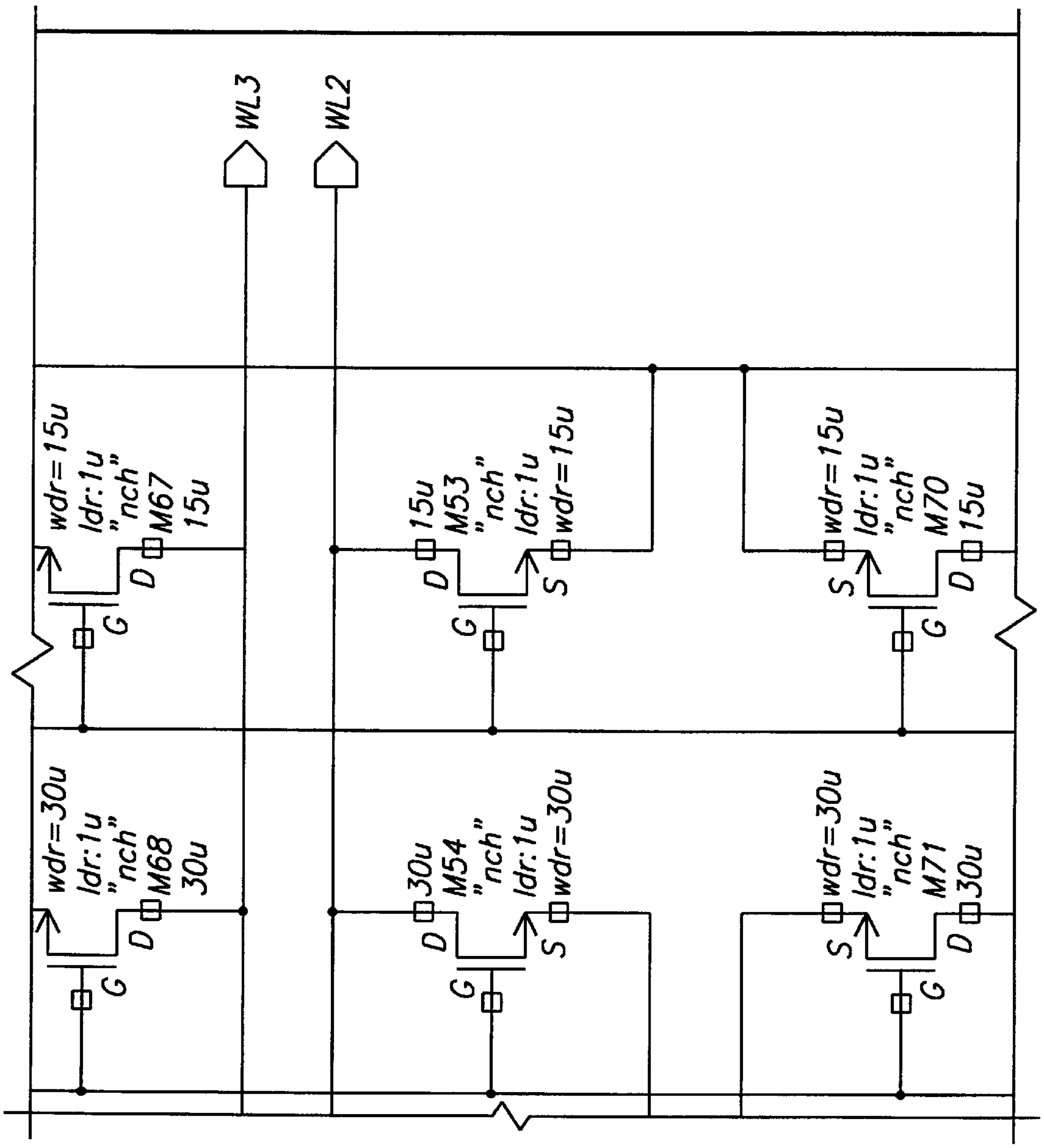
WL3
WL2
wdr=15u
ldr:1u
"nch"
M67
15u
wdr=30u
ldr:1u
"nch"
M68
30u
15u
M53
"nch"
ldr:1u
wdr=15u
30u
M54
"nch"
ldr:1u
wdr=30u
wdr=15u
ldr:1u
"nch"
M70
15u
wdr=30u
ldr:1u
"nch"
M71
30u
G
D
S

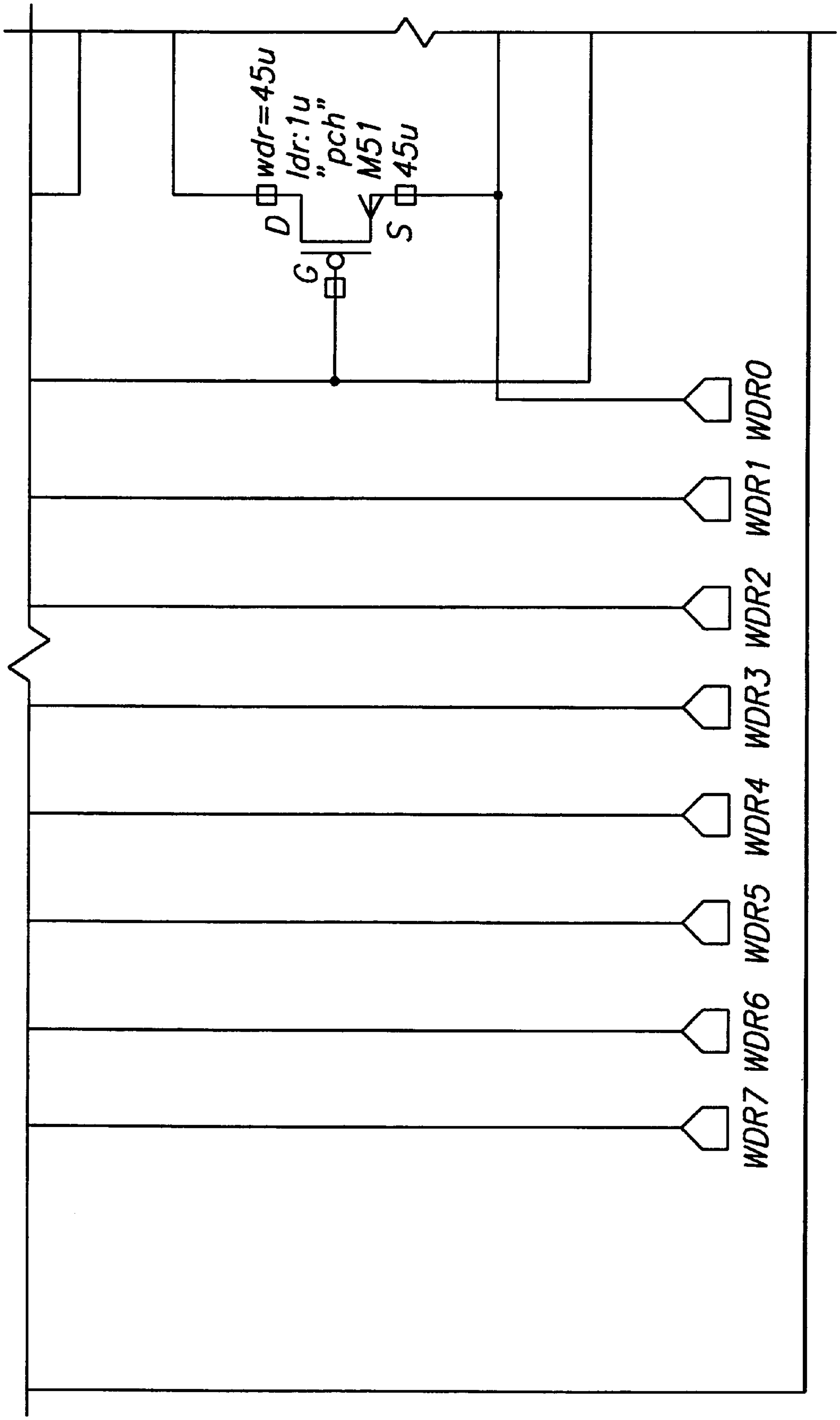
FIG. 7.04.04DB

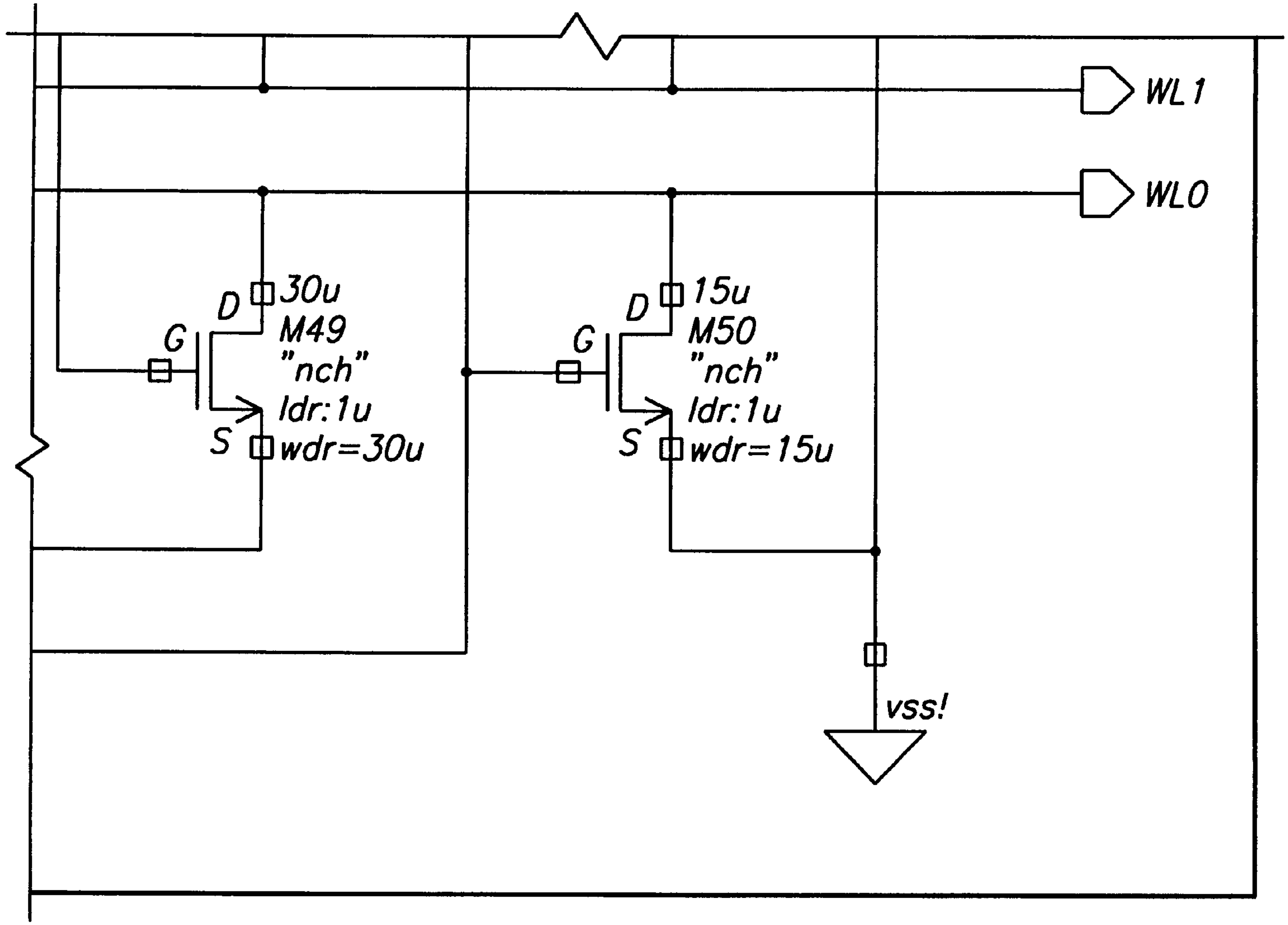
Fig. 7.0404DC

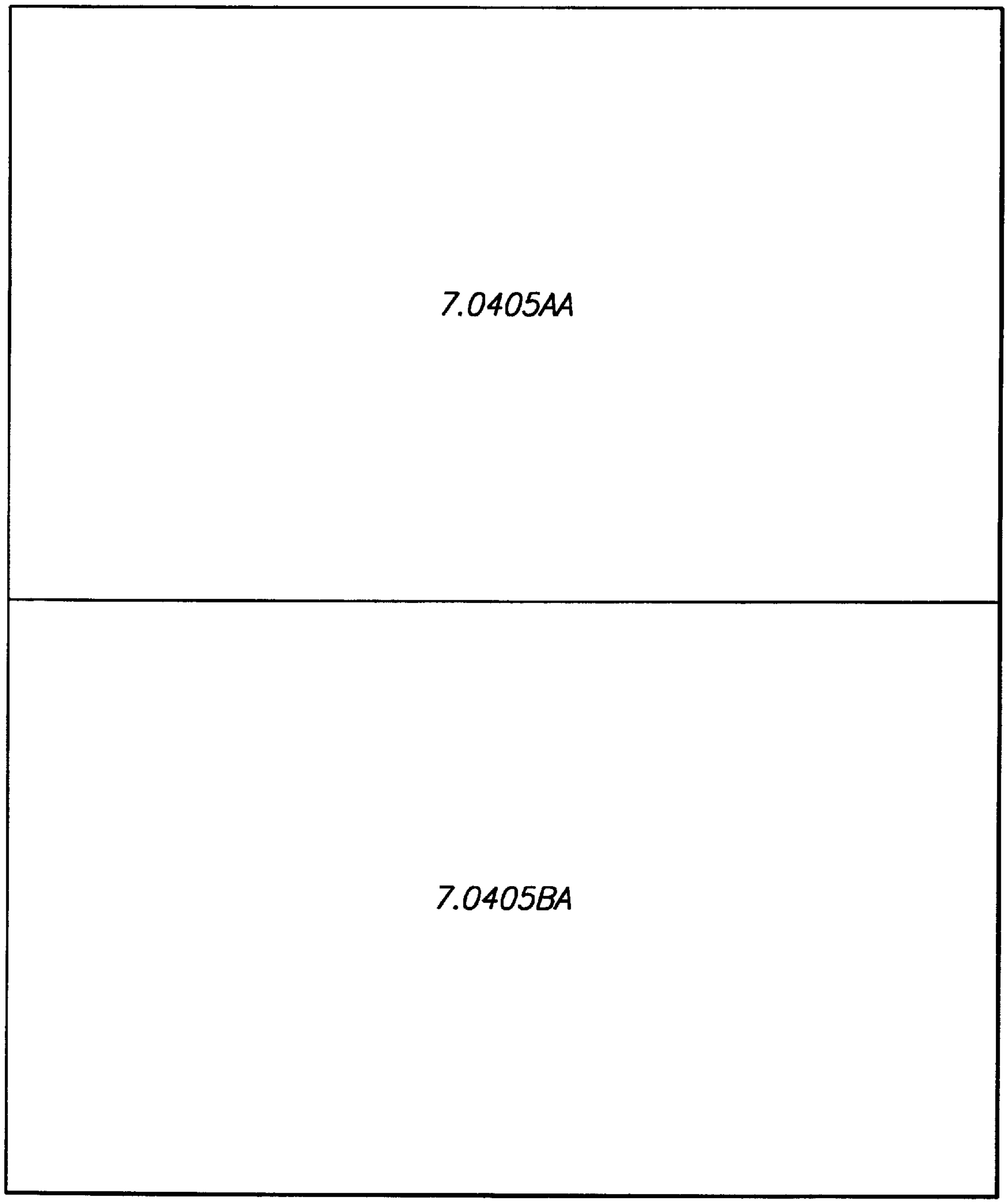
Fig 7.0405

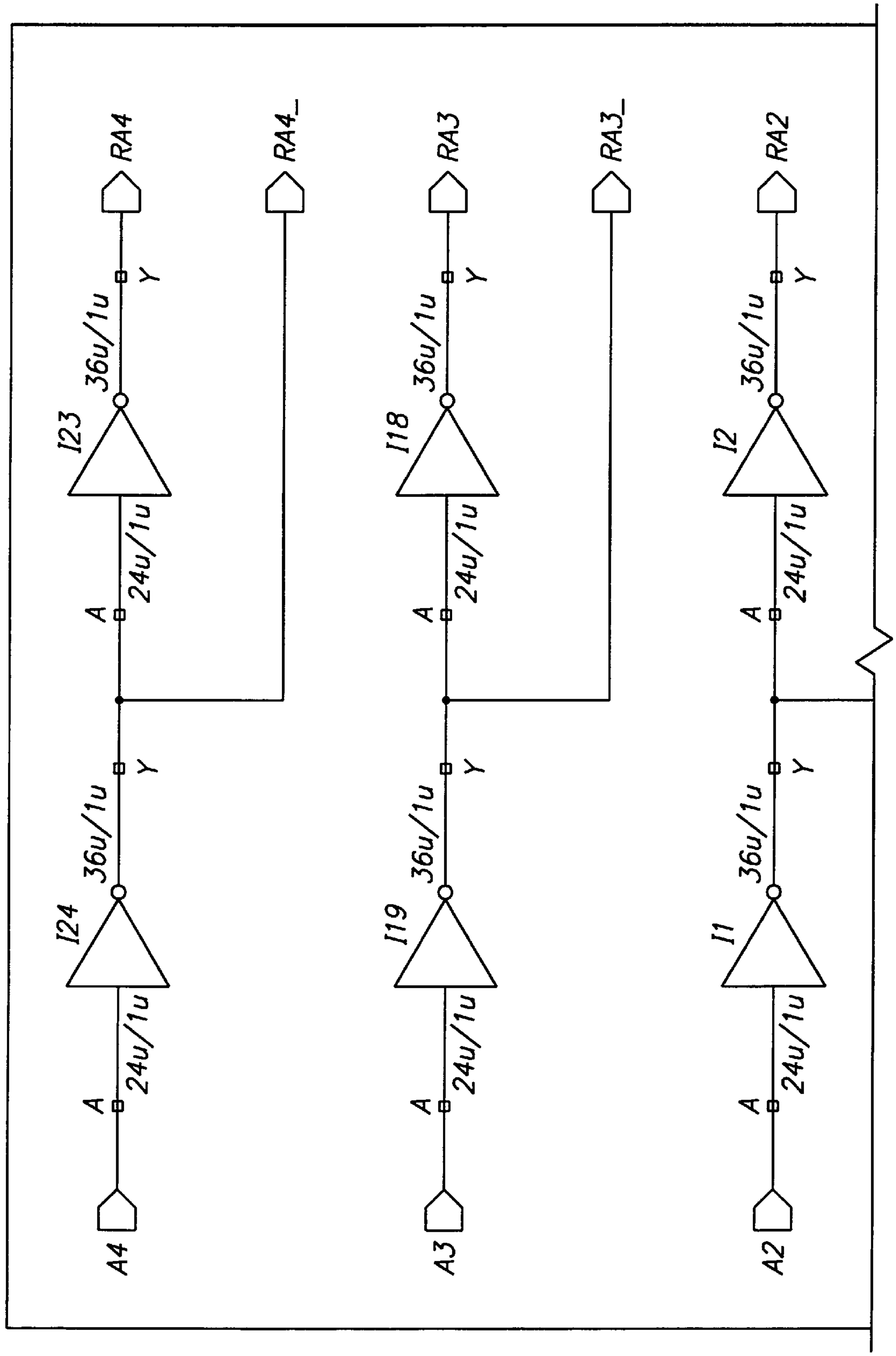
FIG. 7.040SAA

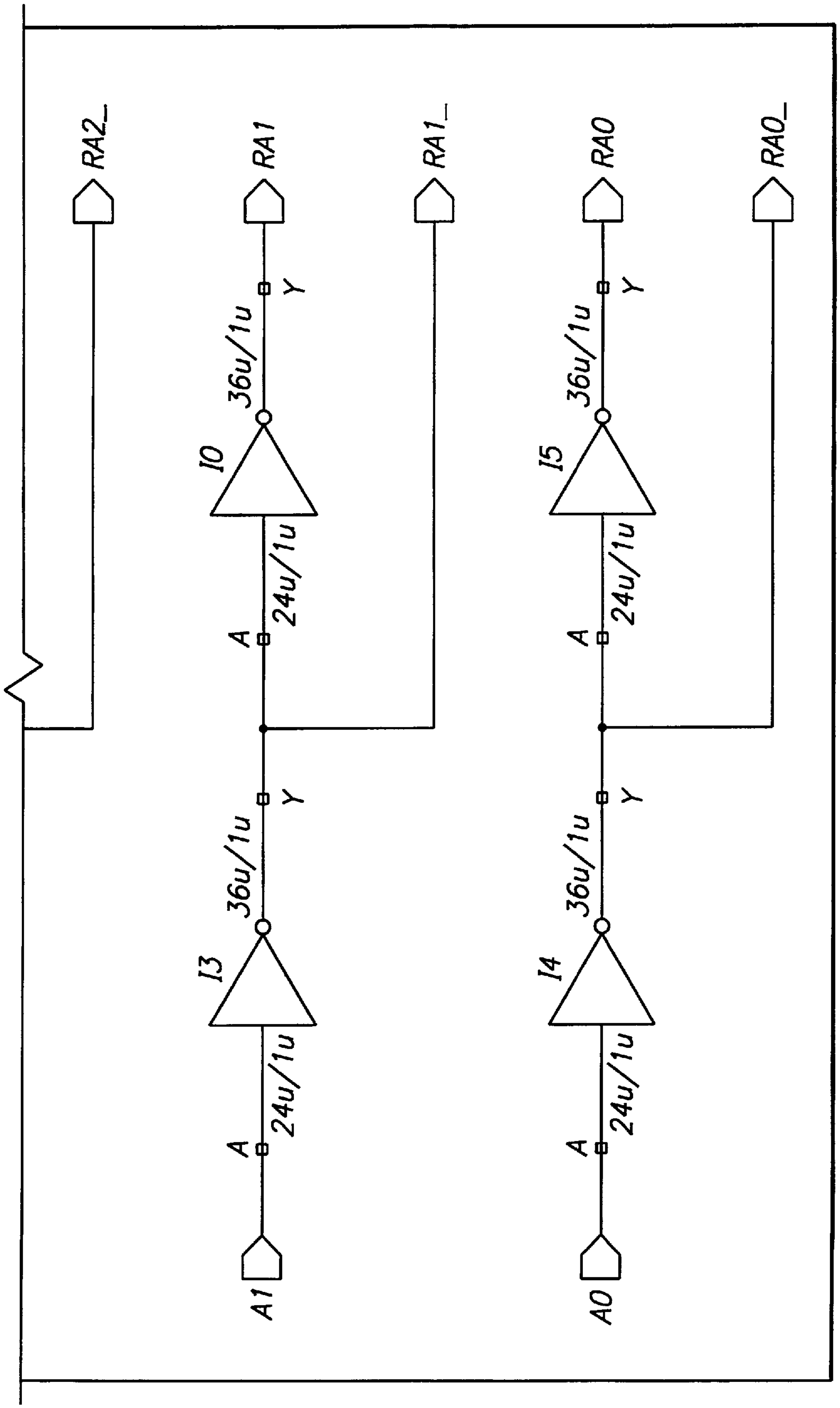
FIG. 7.04.05BA

| | | | | | | | | | | |
|---|---|---|---|---|---|---|---|---|---|---|
| 7.0406AA | 7.0406AB | 7.0406AC | 7.0406AD | 7.0406AE | 7.0406AF | 7.0406AG | 7.0406AH | 7.0406AI | 7.0406AJ | |
| 7.0406BA | 7.0406BB | 7.0406BC | 7.0406BD | 7.0406BE | 7.0406BF | 7.0406BG | 7.0406BH | 7.0406BI | 7.0406BJ | 7.0406BK |
| 7.0406CA | 7.0406CB | 7.0406CC | 7.0406CD | 7.0406CE | 7.0406CF | 7.0406CG | 7.0406CH | 7.0406CI | 7.0406CJ | 7.0406CK |

Fig 7.0406

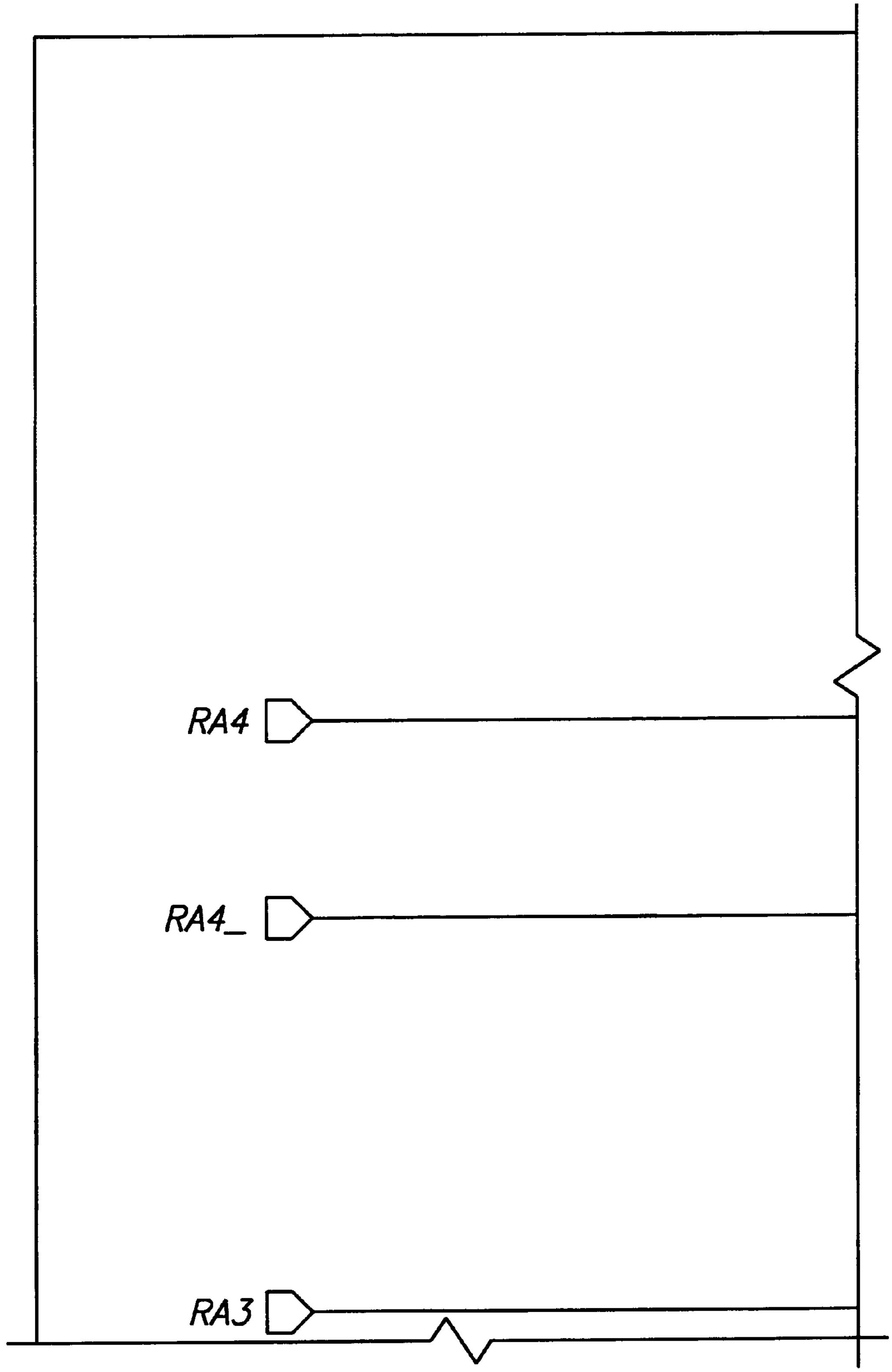
FIG. 1.04.06AA

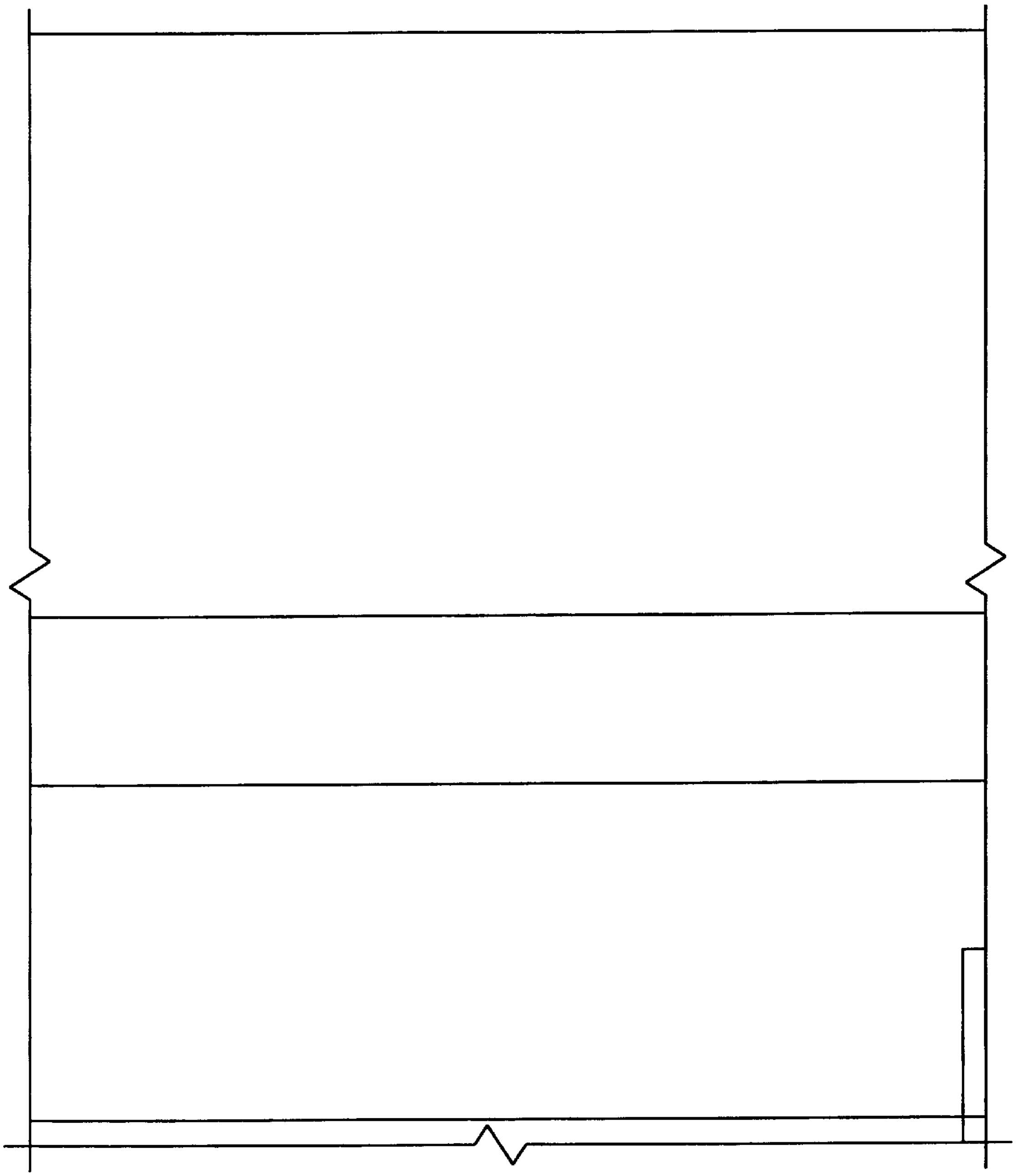
FIG 7.0406AB

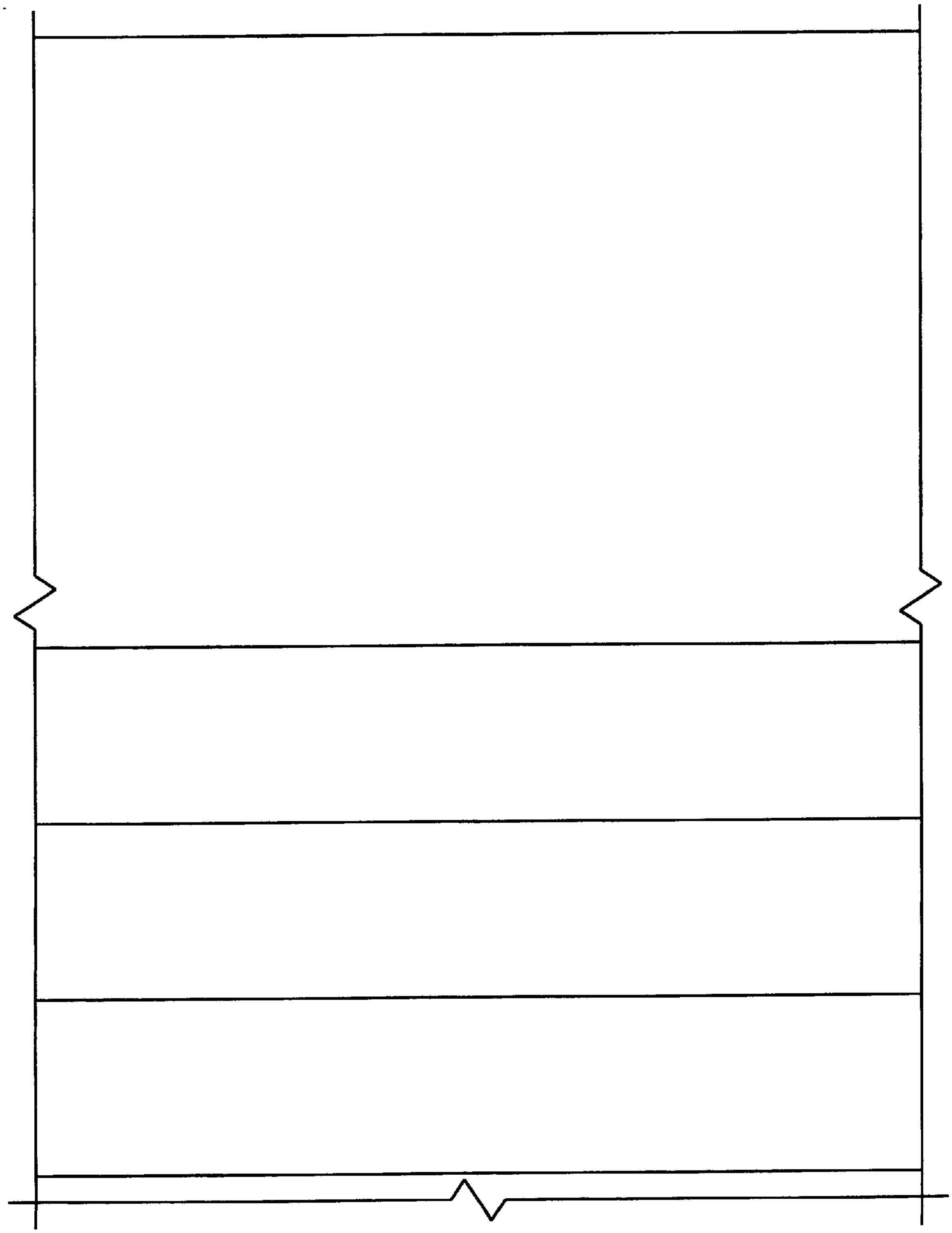
Fig 7.0406AC

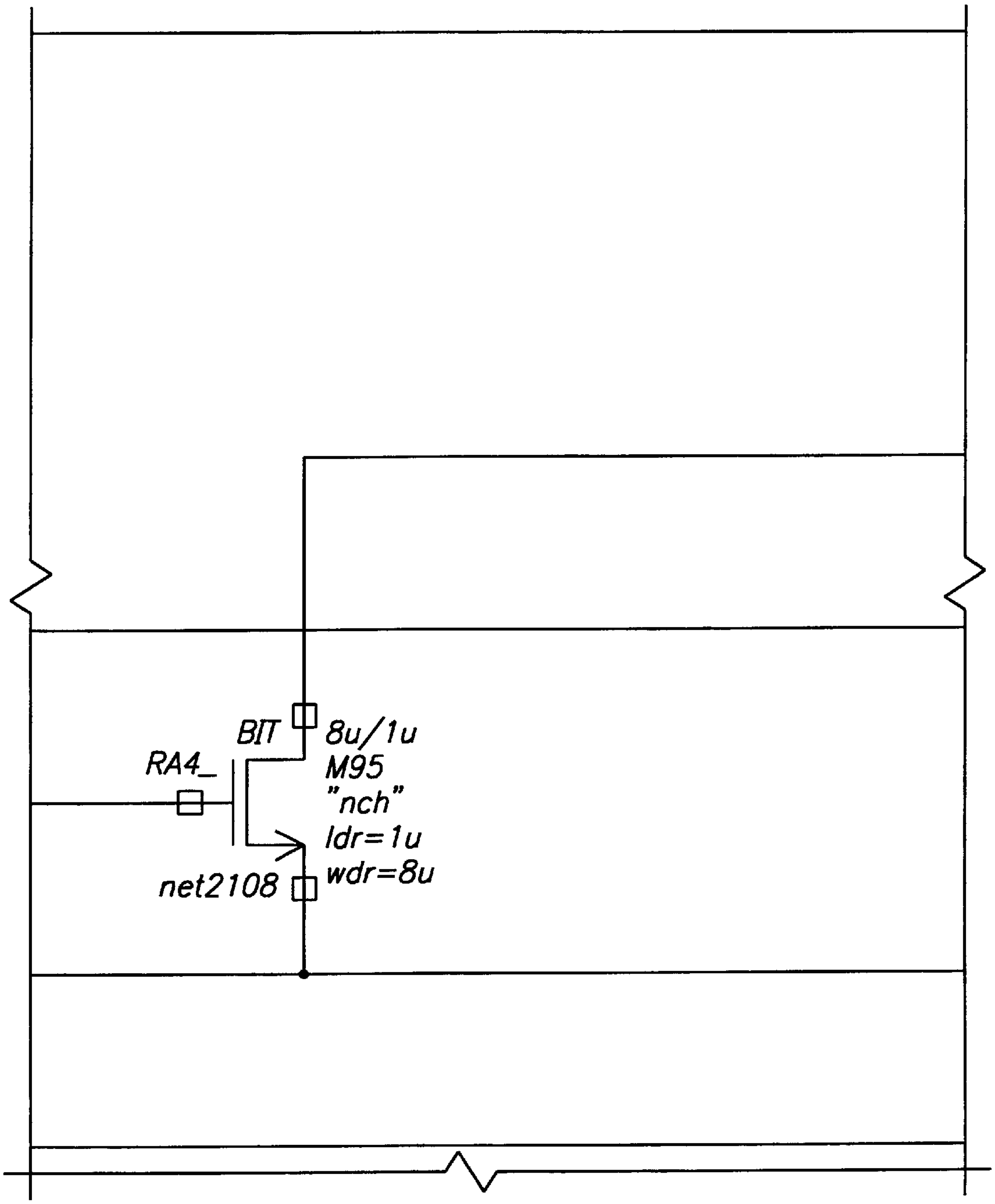
FIG 7.0406AD

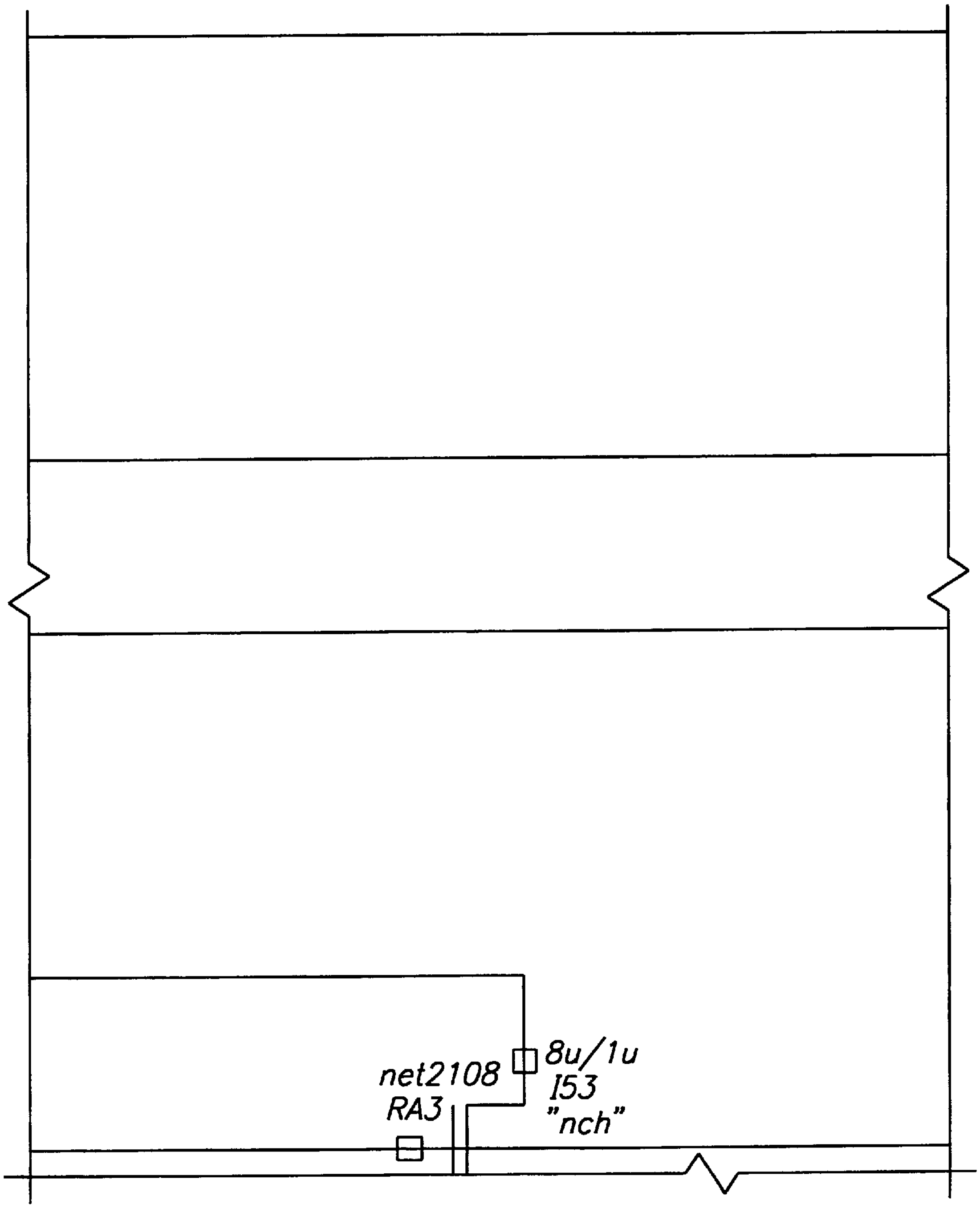
Fig 1.0406AE

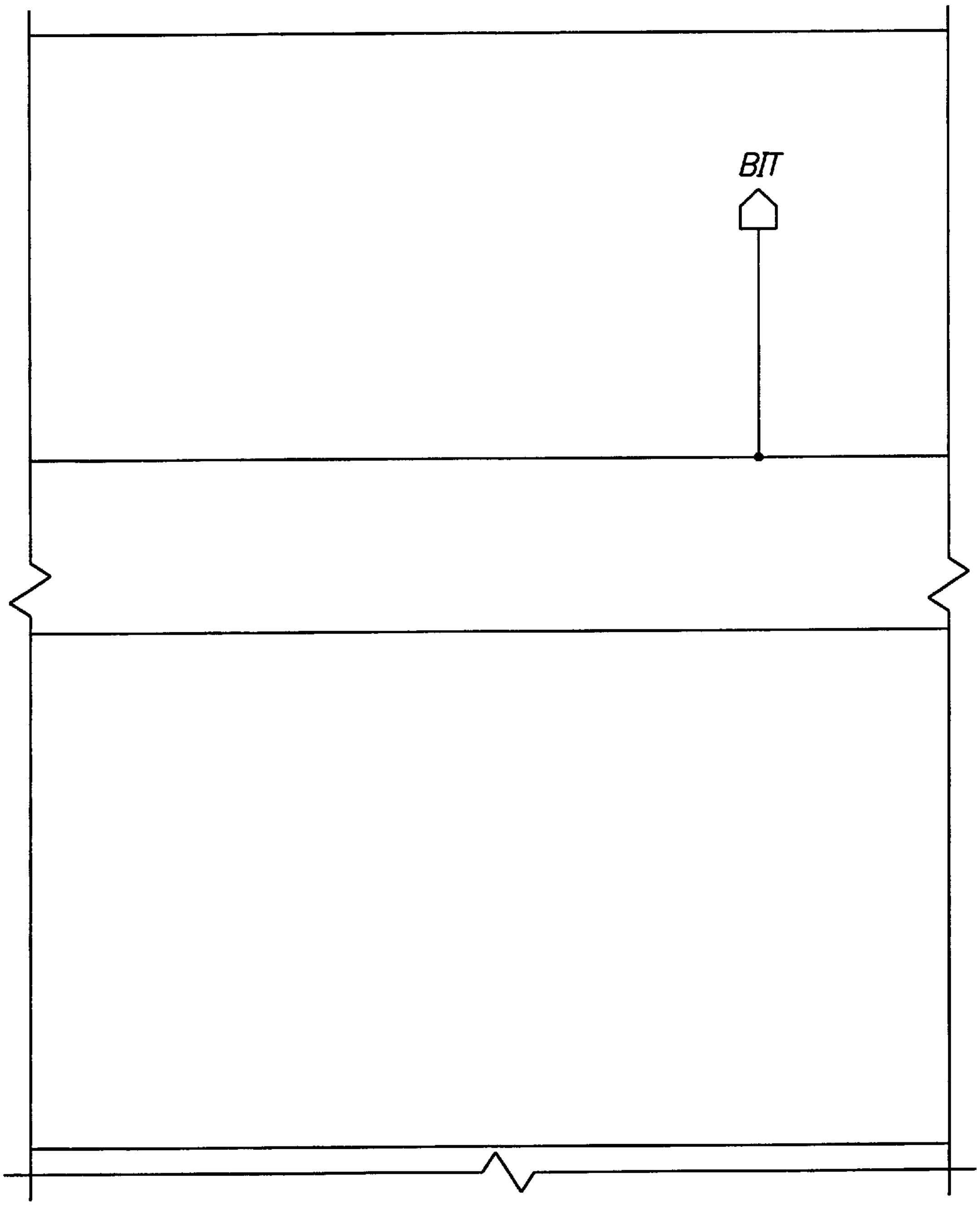
Fig 7.0406AF

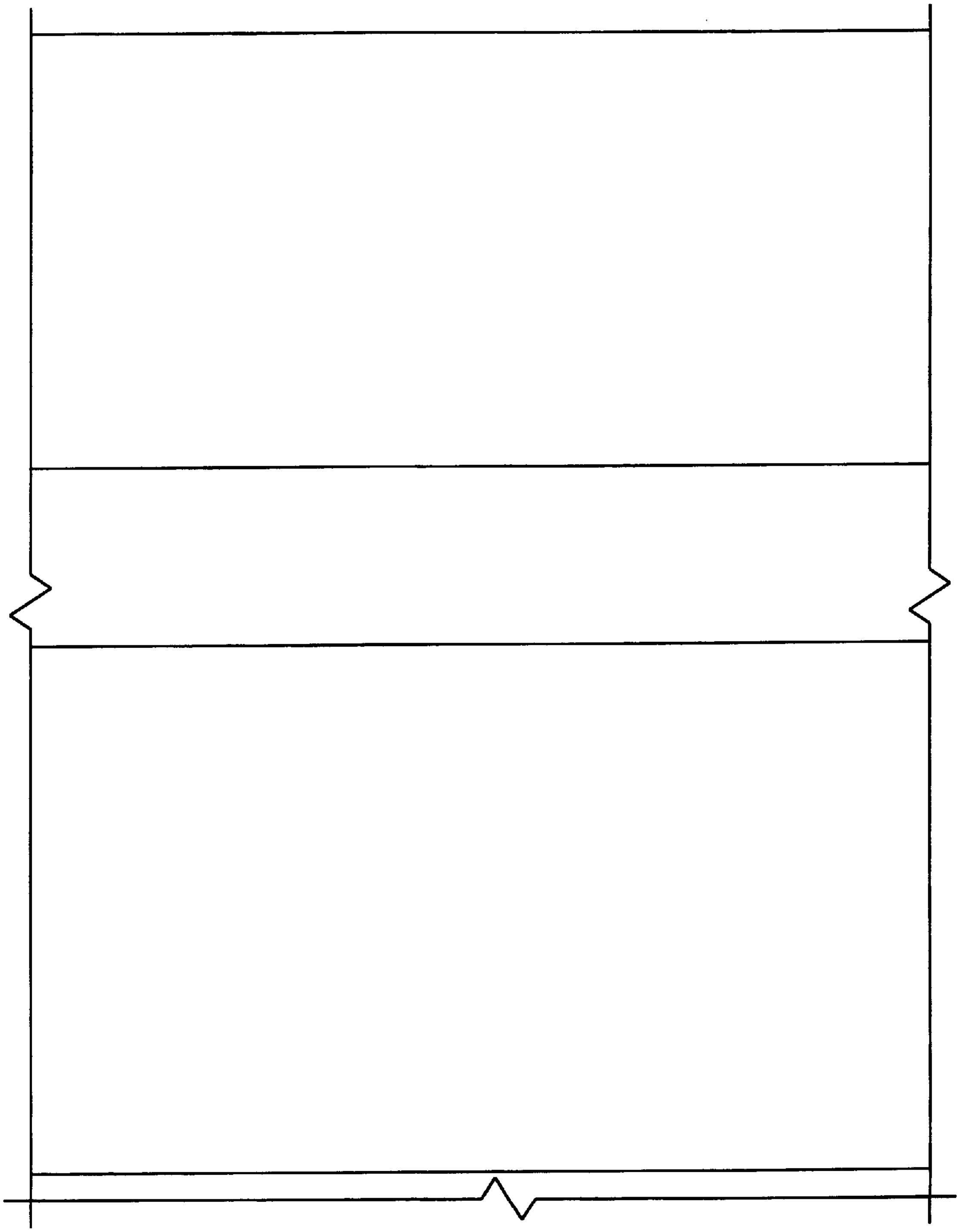
FIG 7.0406AG

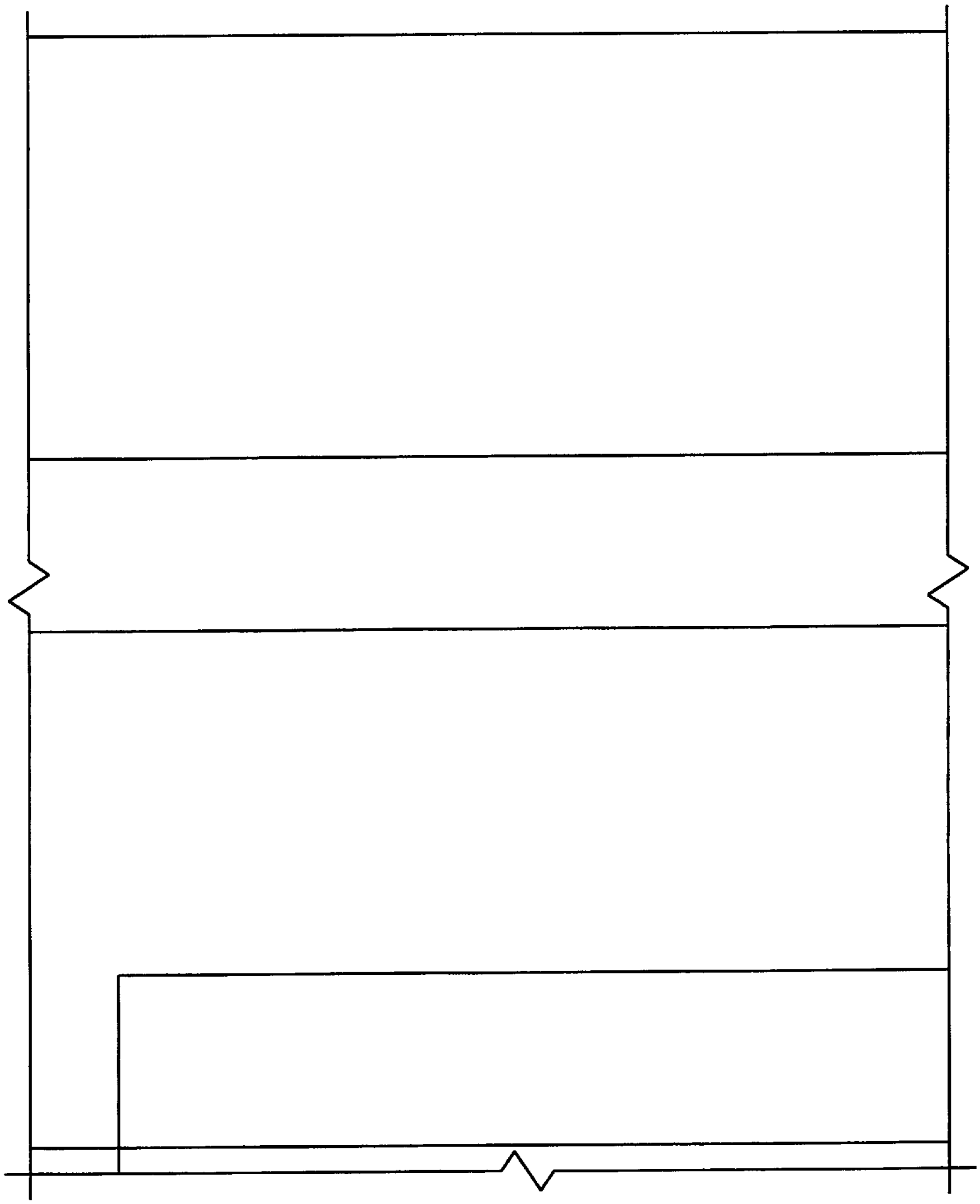
Fig. 7.0406AH

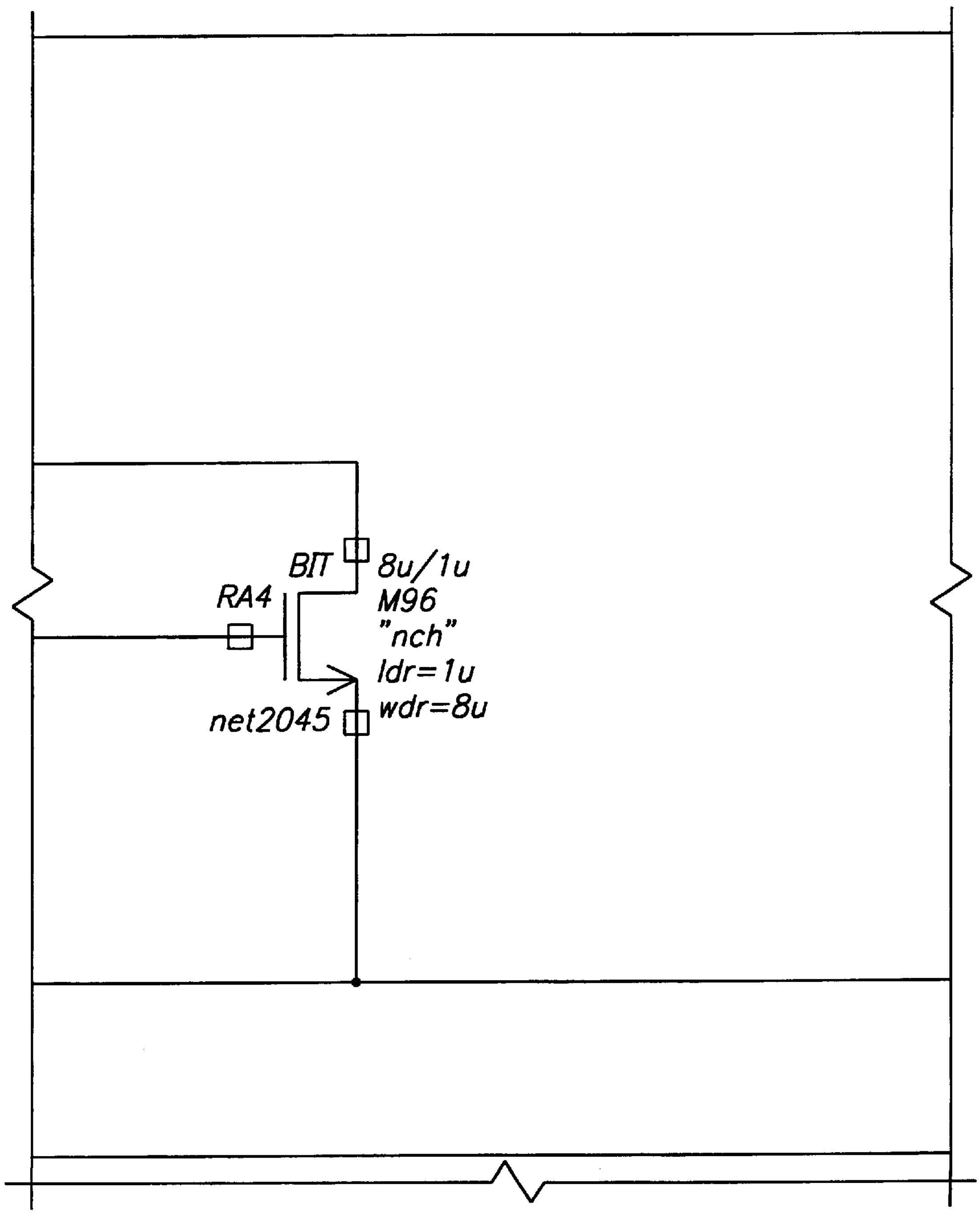
Fig 7.0406AI

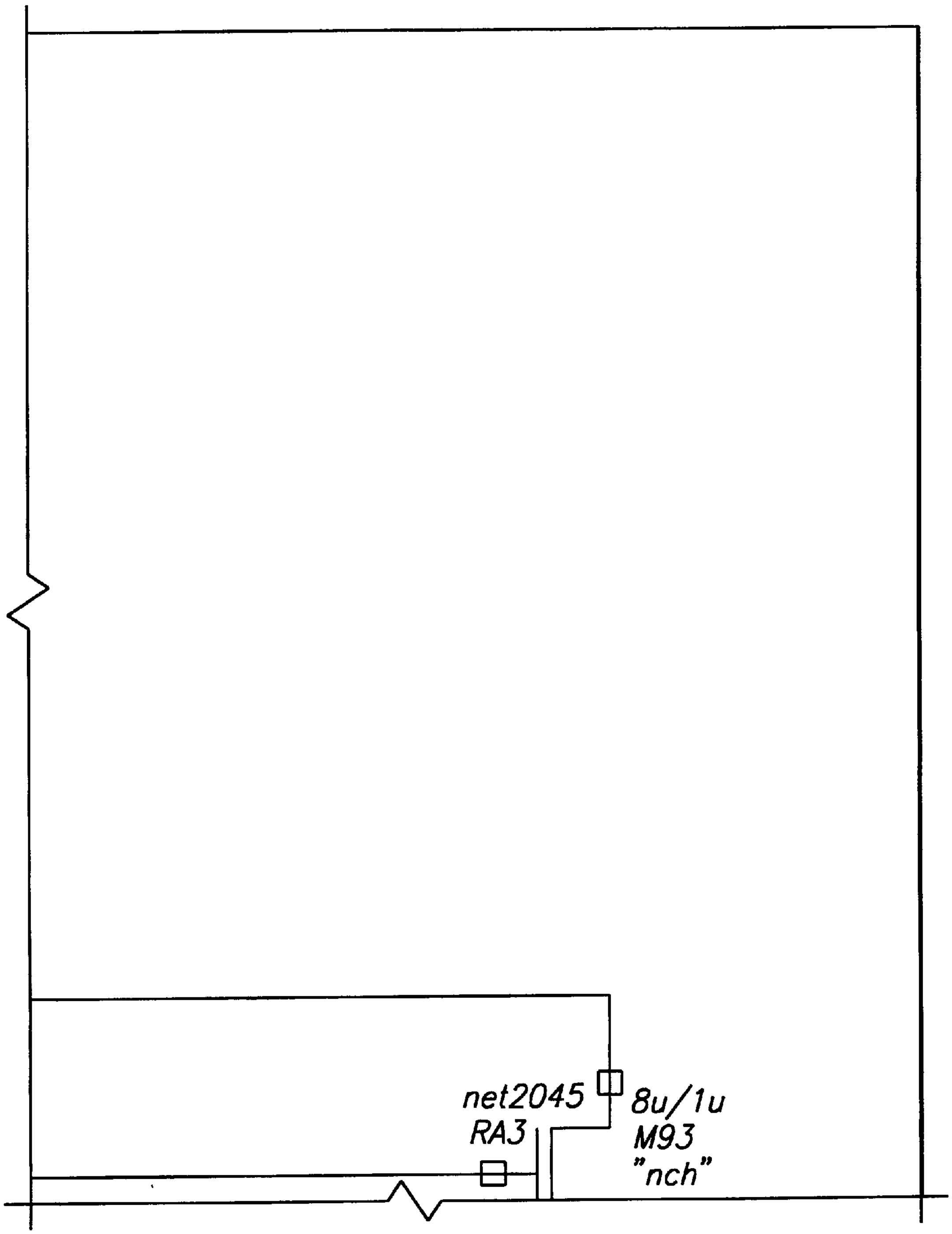
Fig 7.04O6AJ

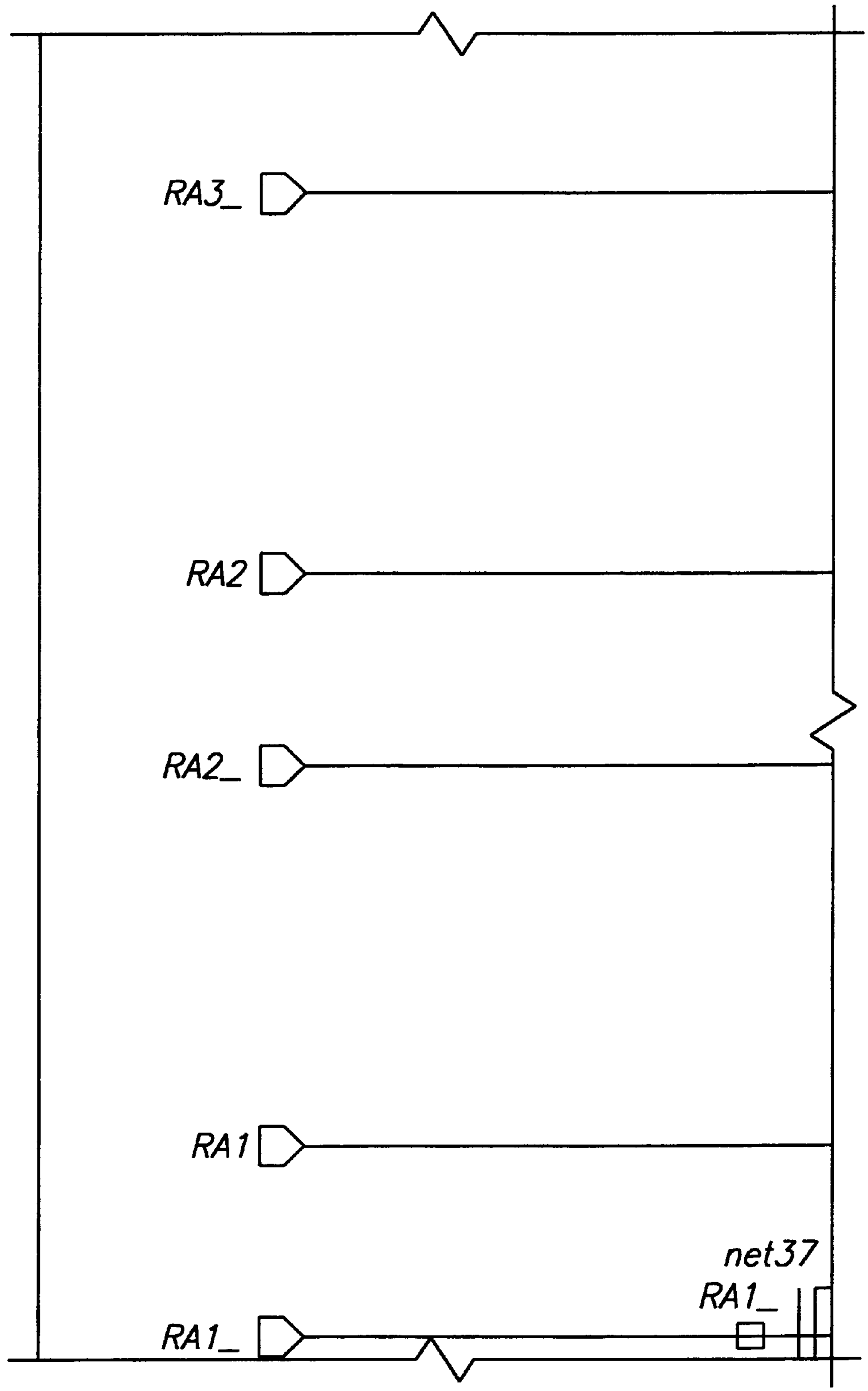
FIG 1.0406BA

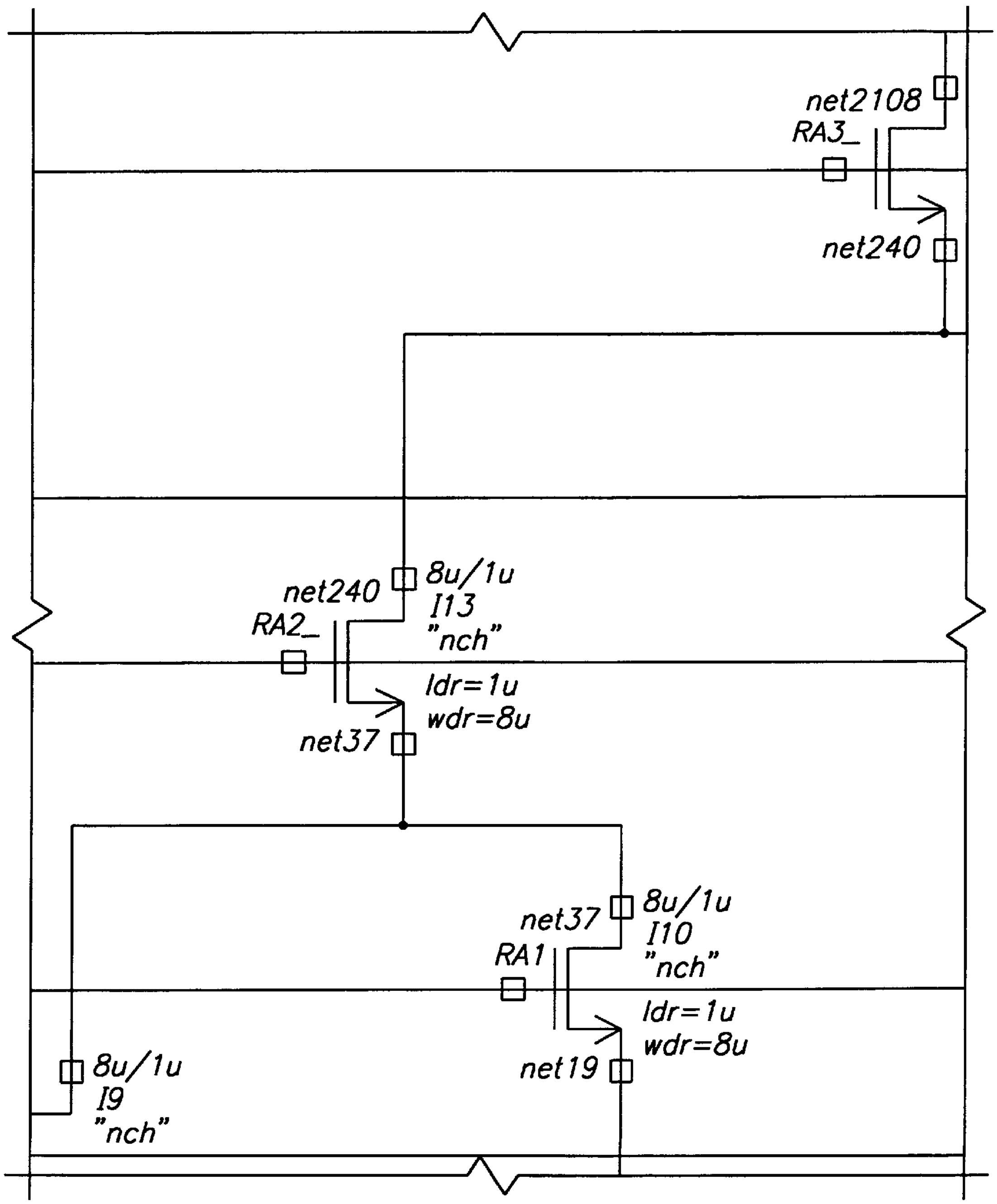
FIG 7.0406BB

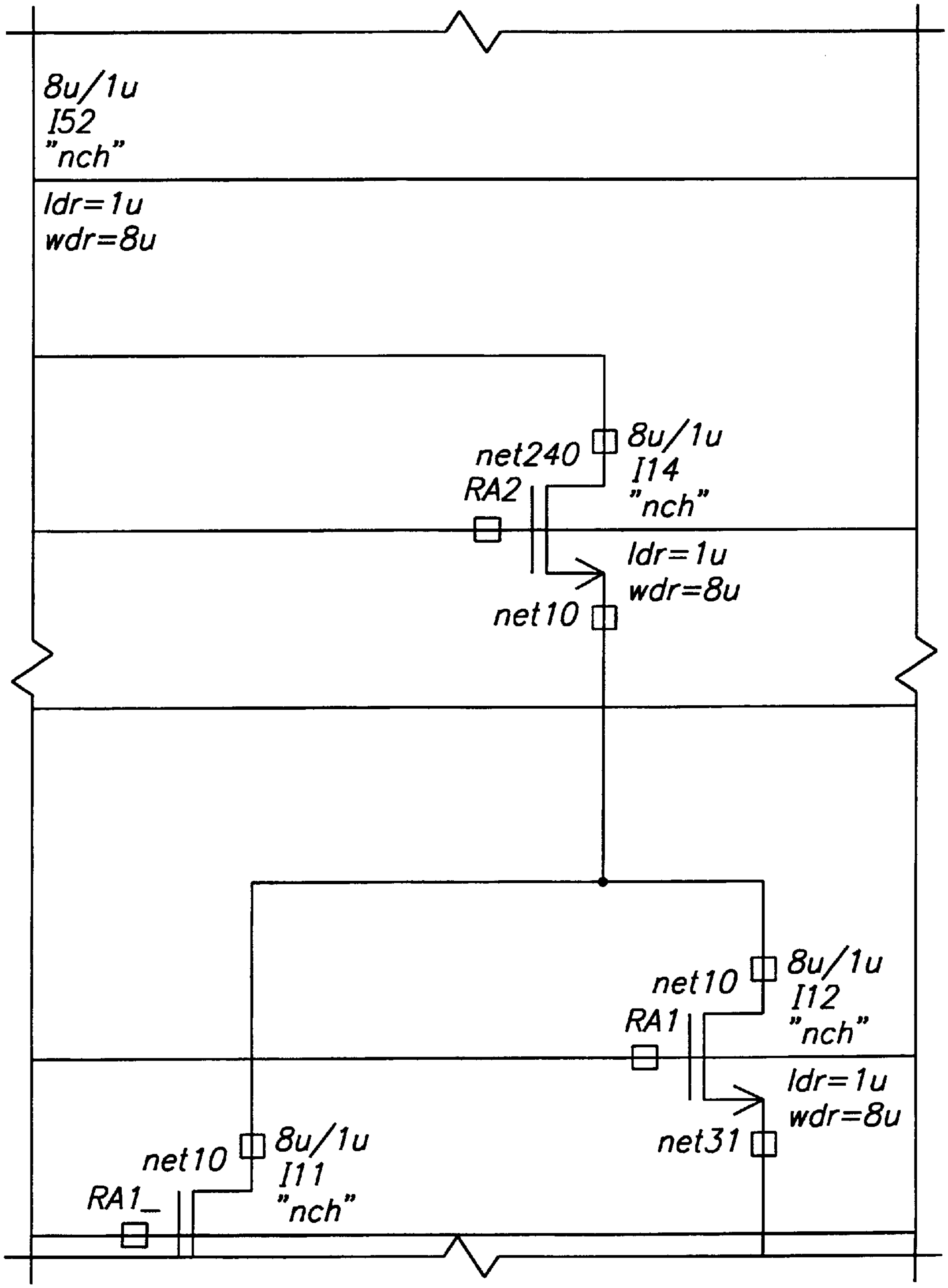
Fig 7.0406BC

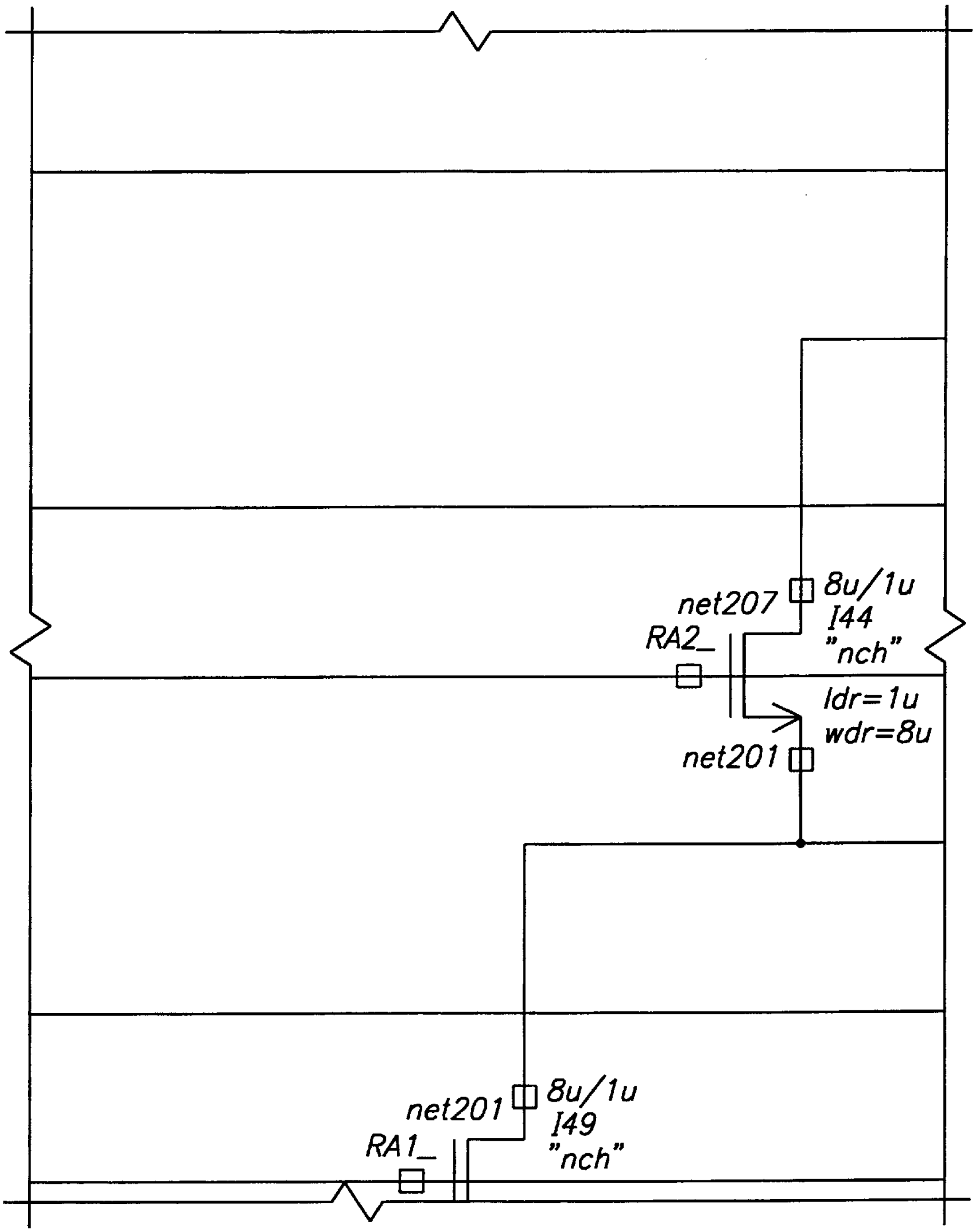
Fig 1.04068D

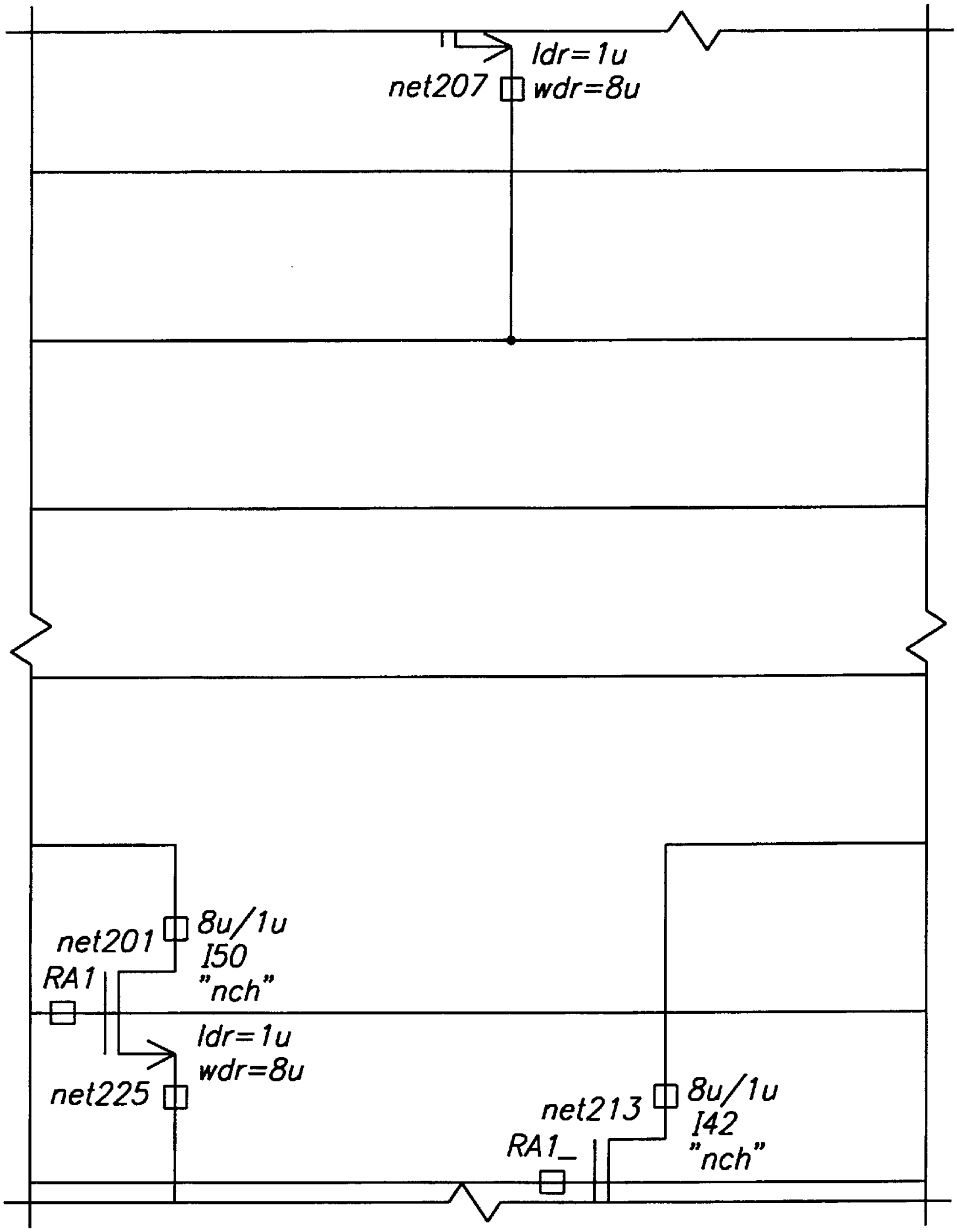
Fig 1.04106BE

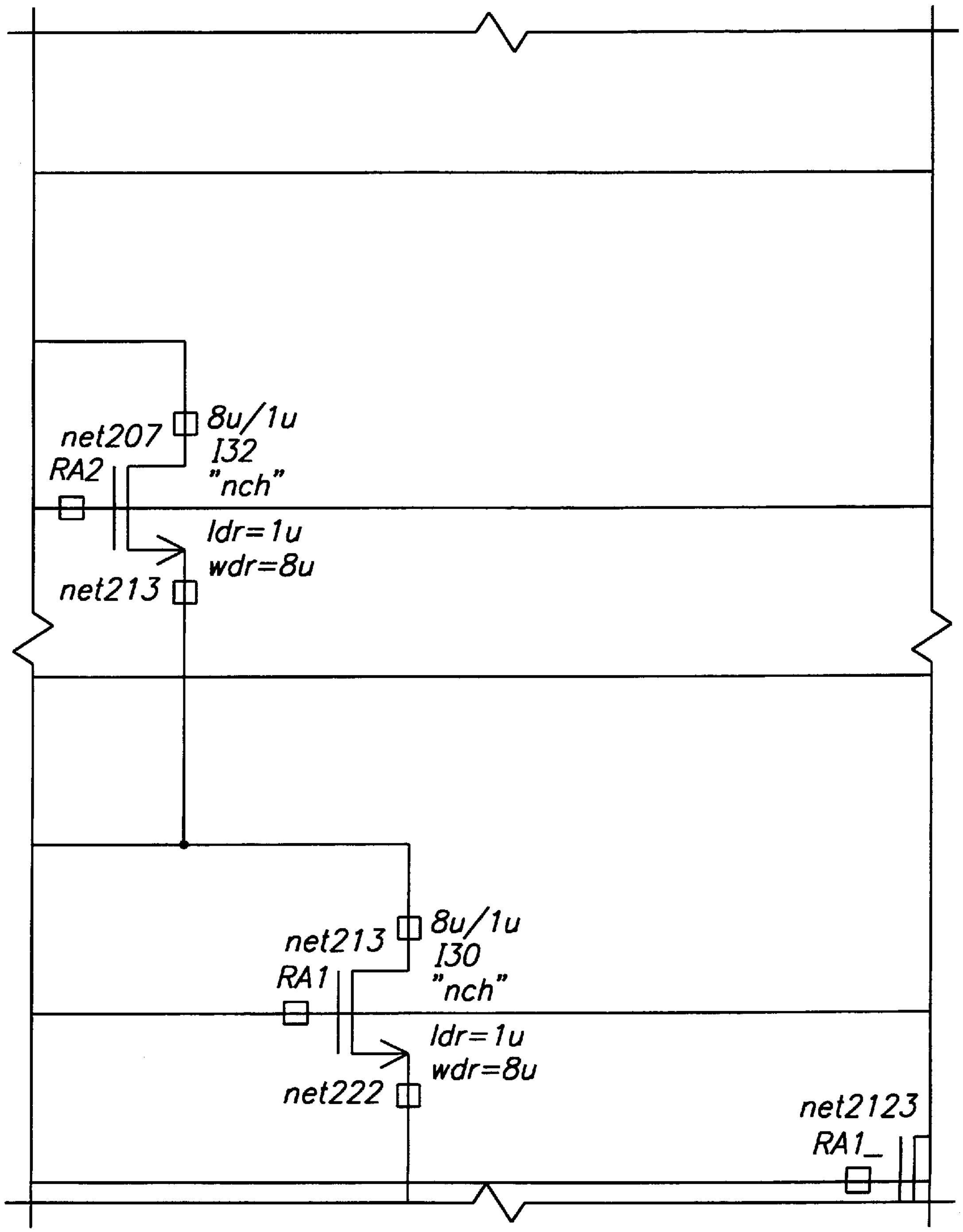
Fig 1.04068F

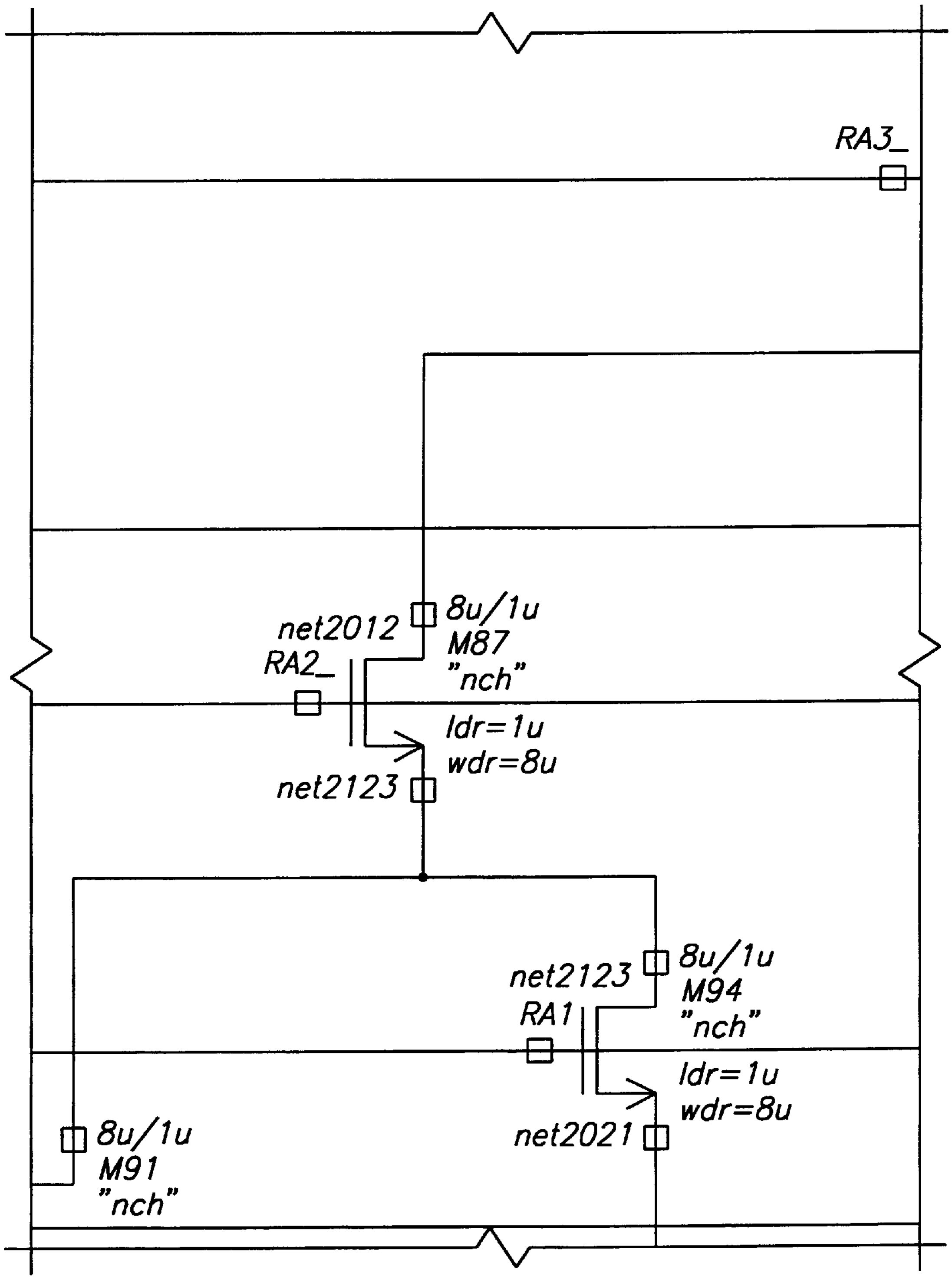
Fig 1.04.06BG

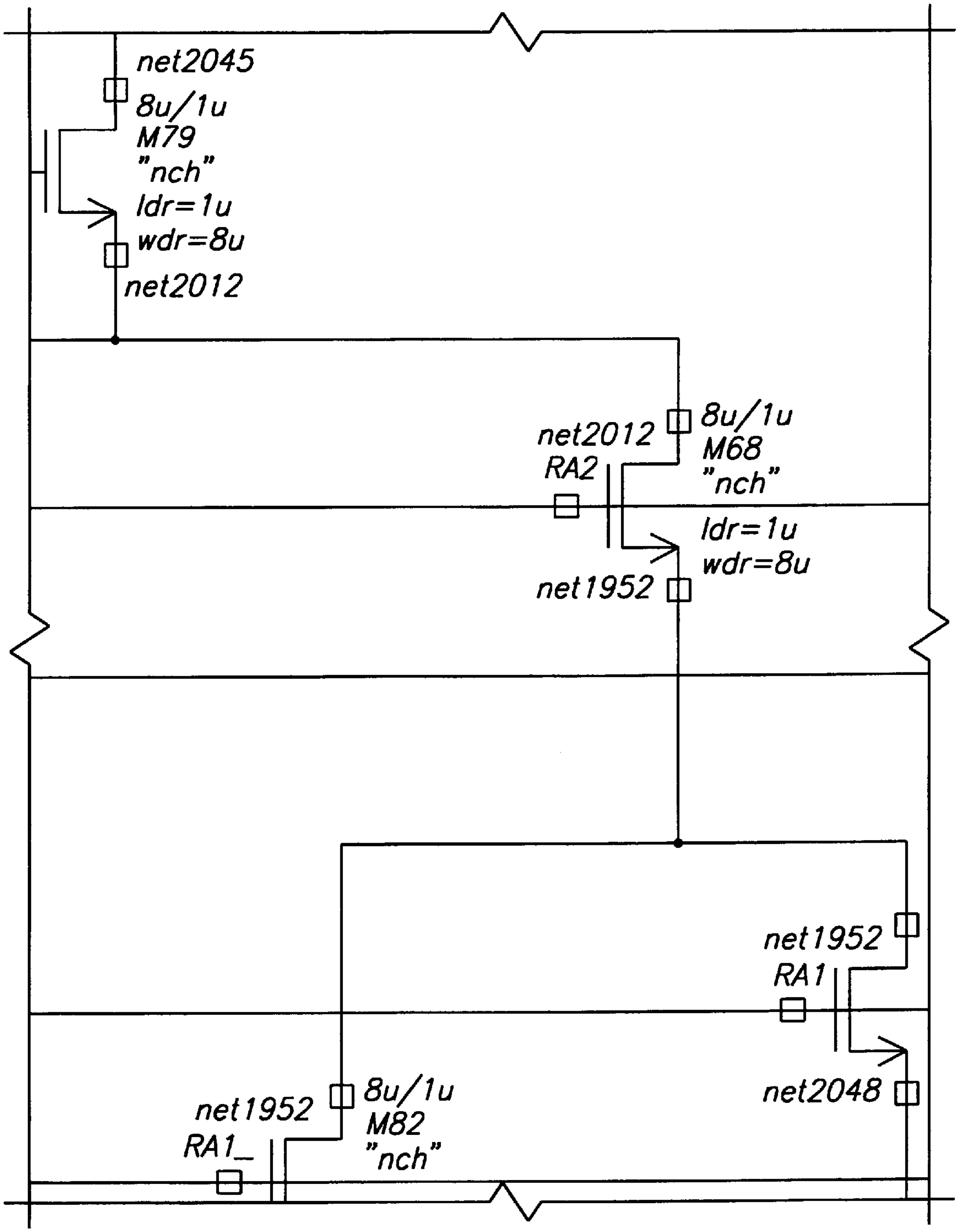
Fig 1.0406BH

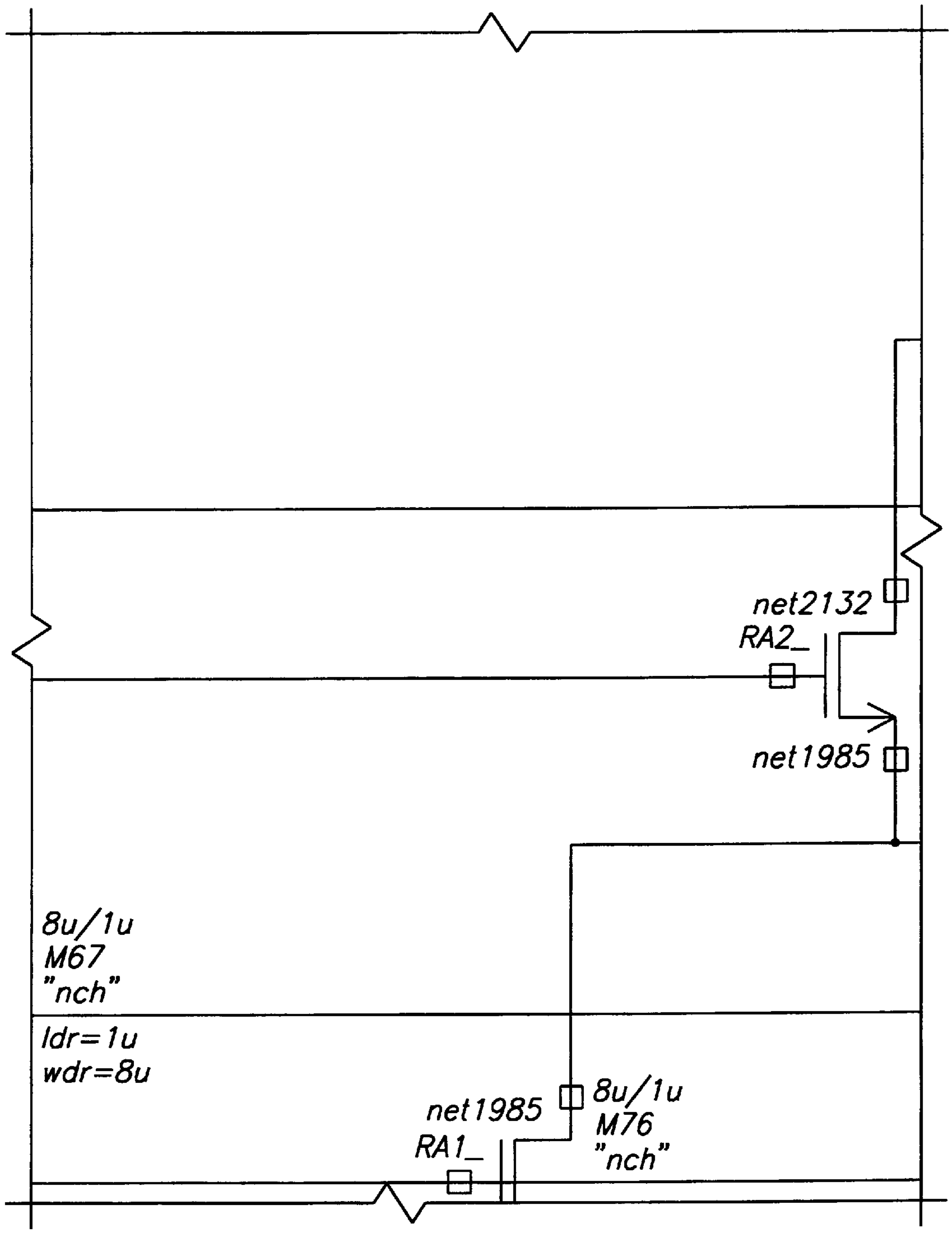
Fig 7.04106BI

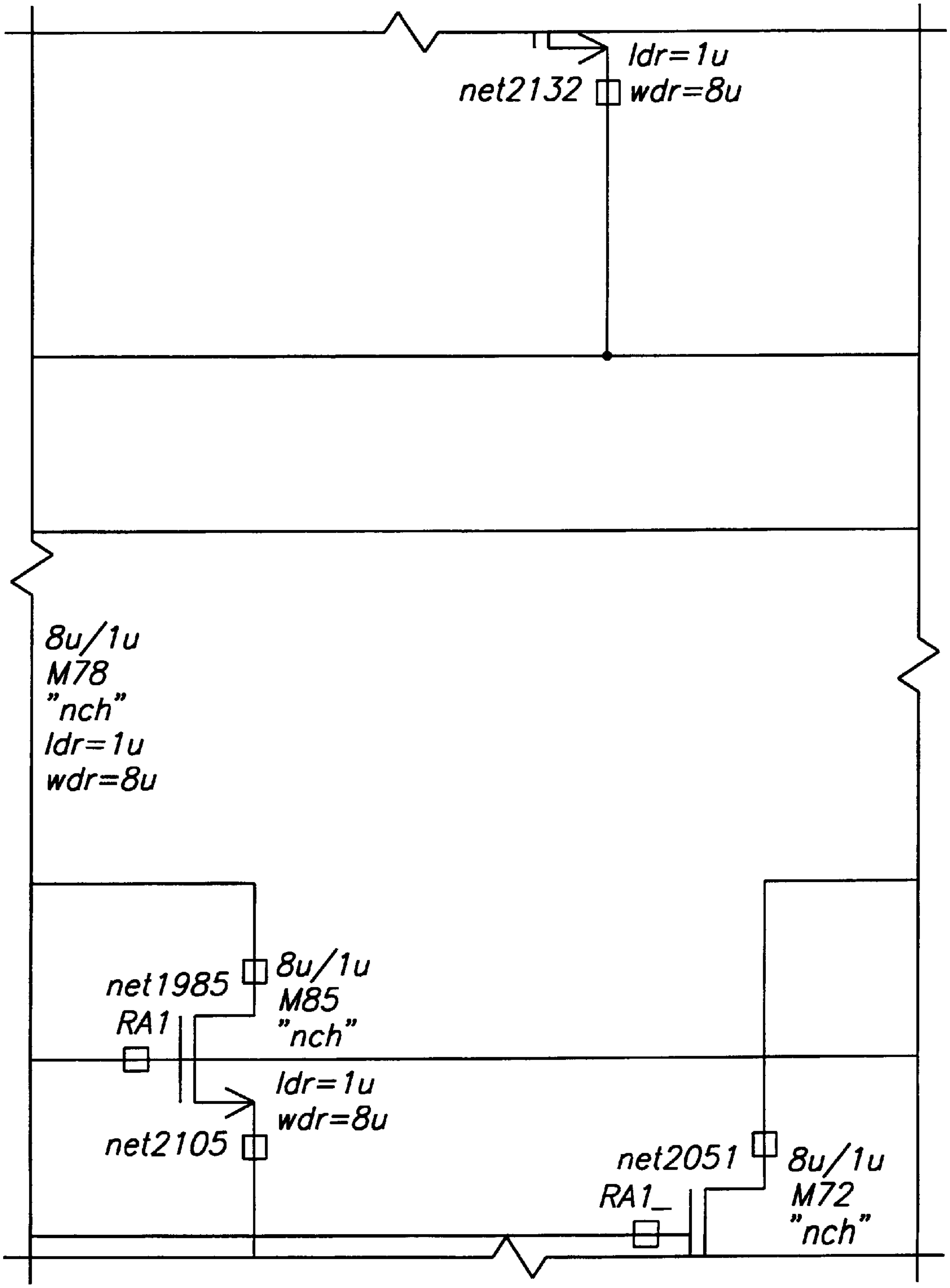
Fig 1.04.06B.1

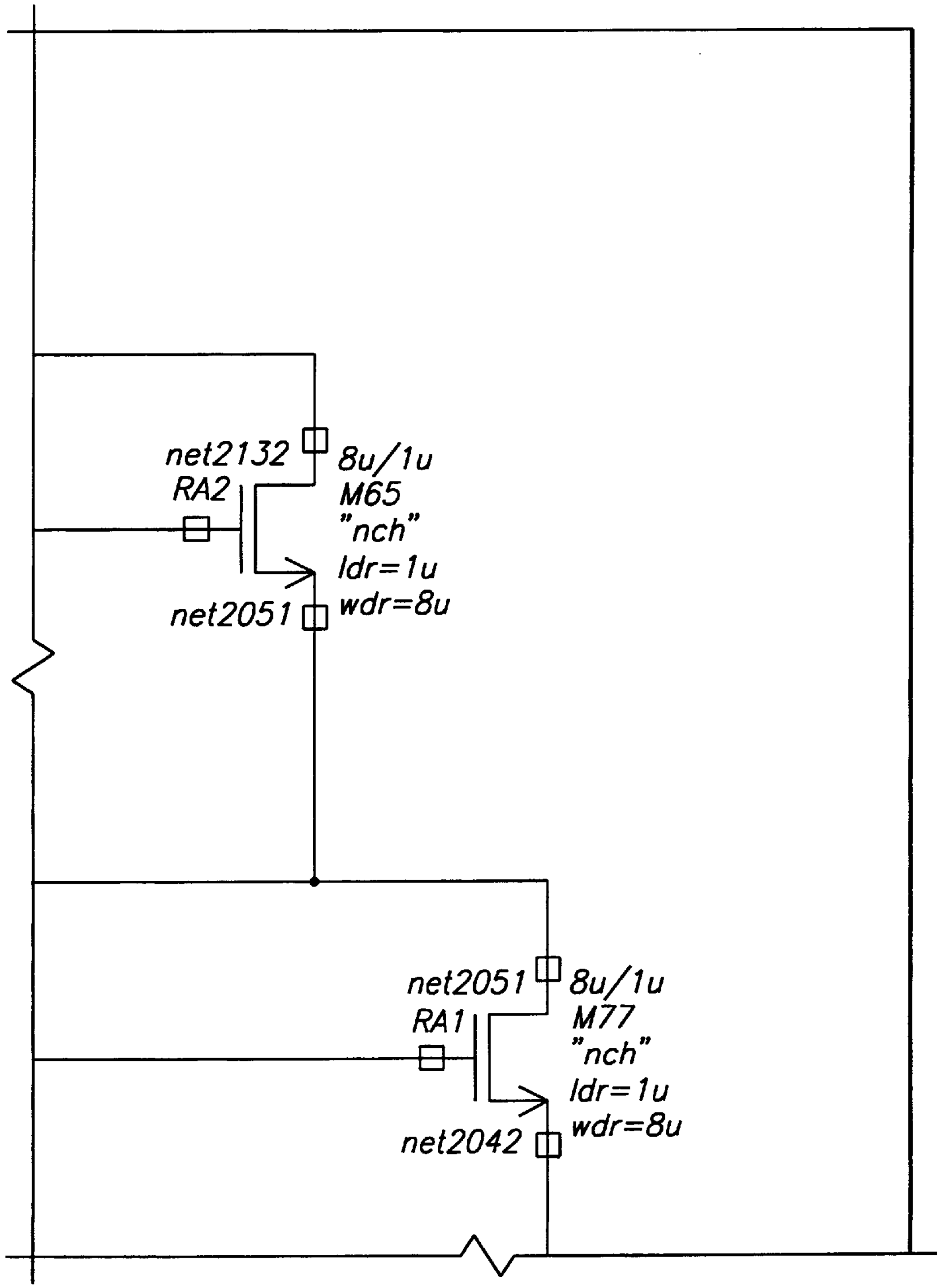
Fig 7.04O6BK

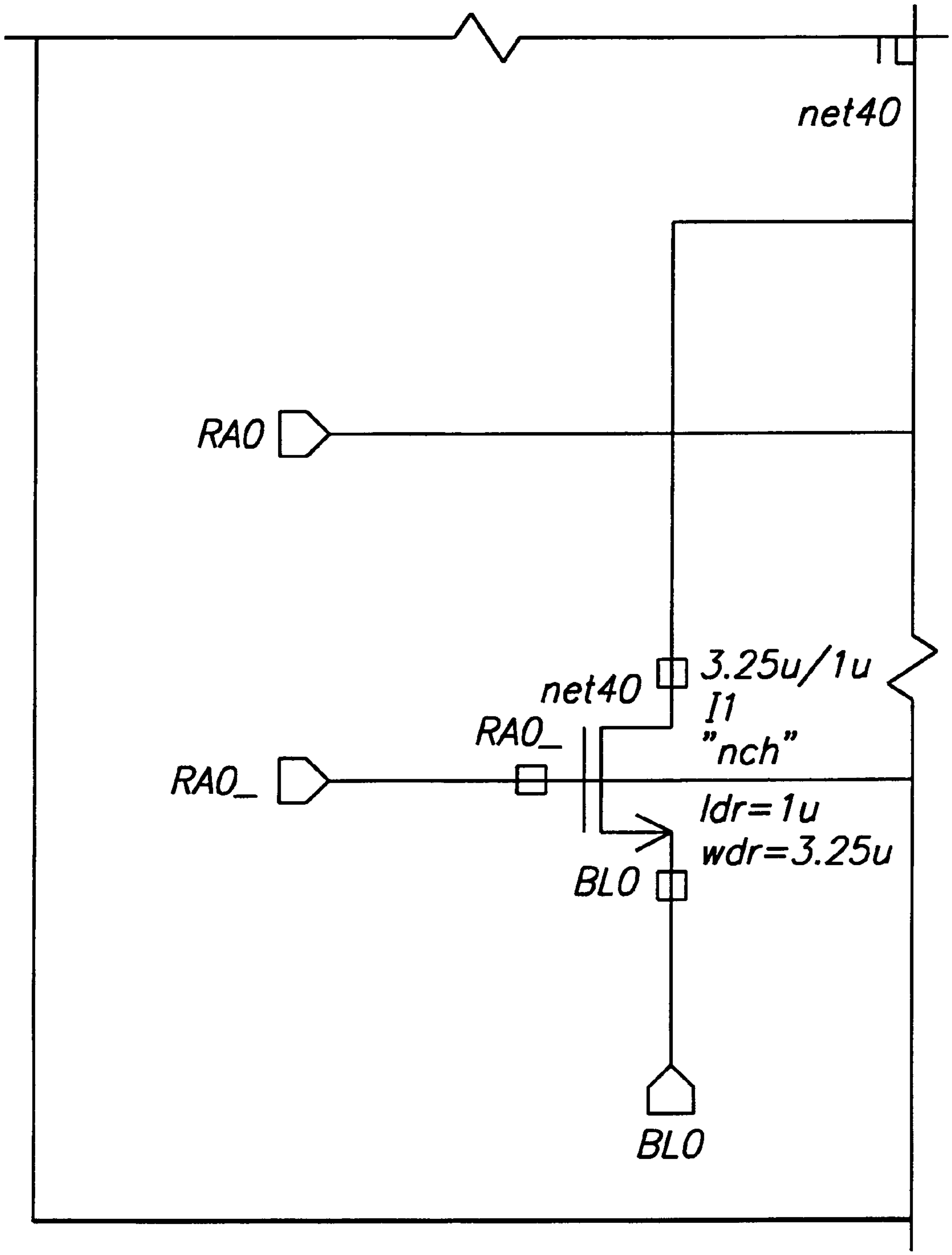
Fig 1.04406CA

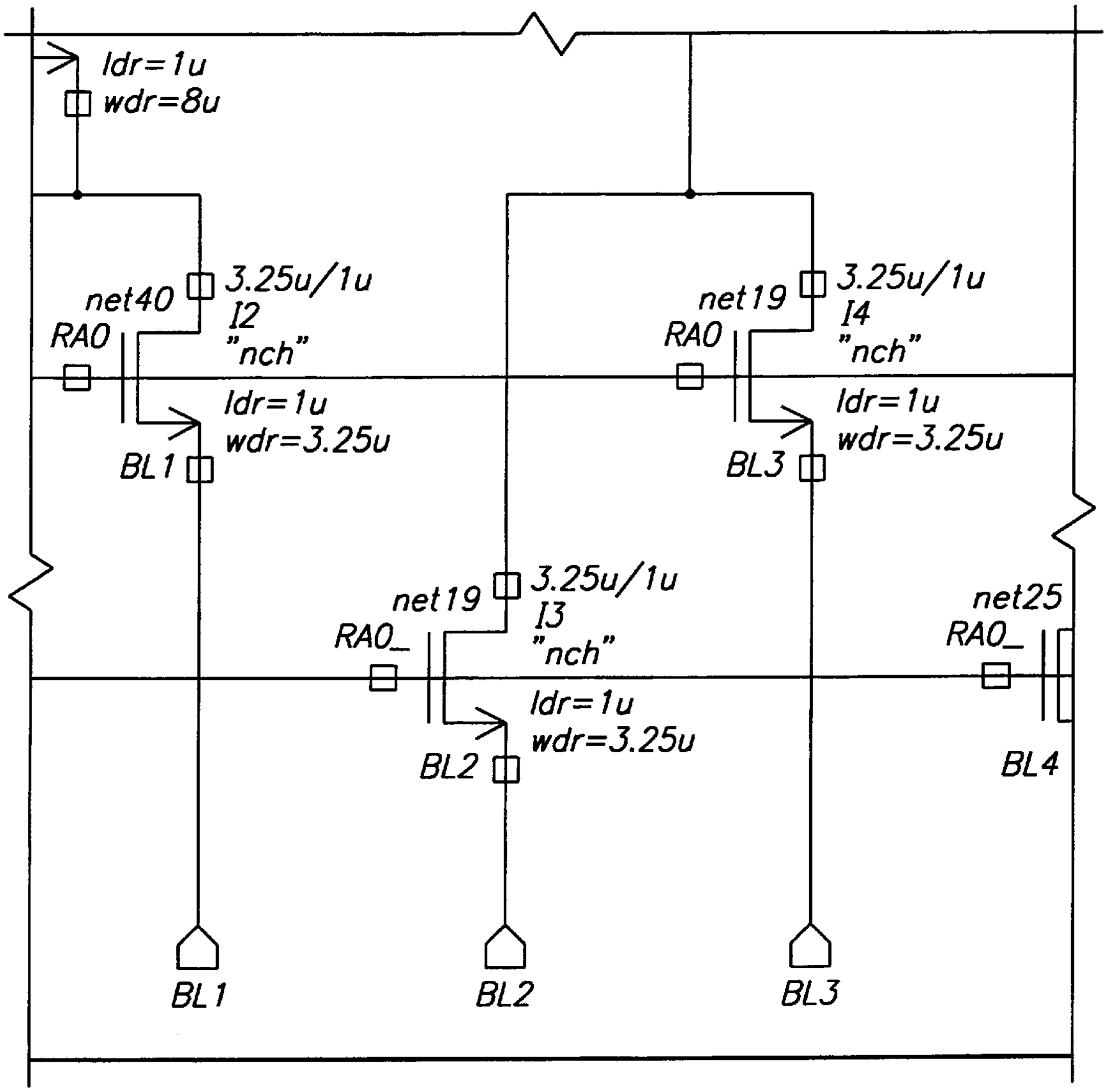
Fig 7.04.06CB

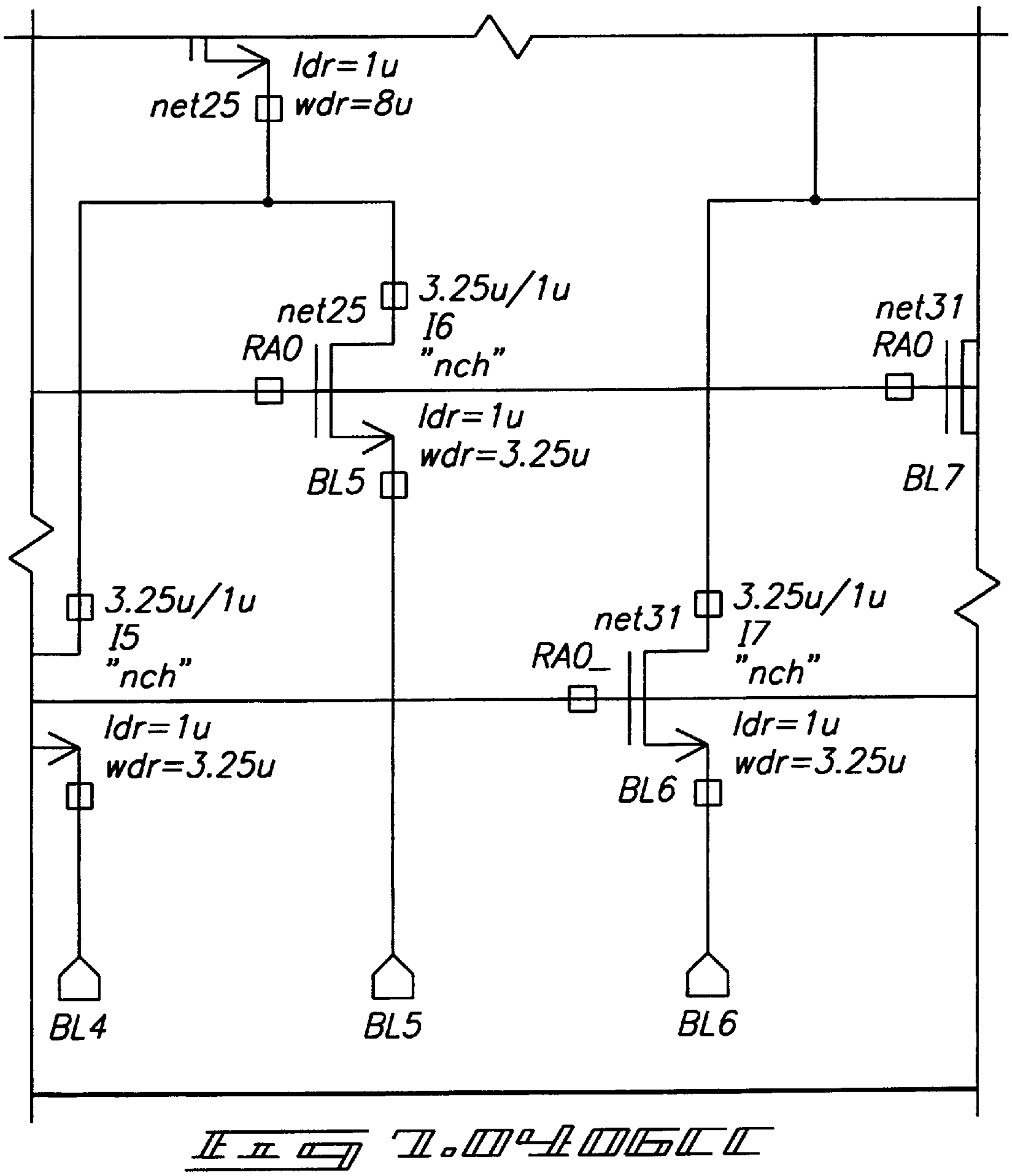
Fig 7.04O6CC

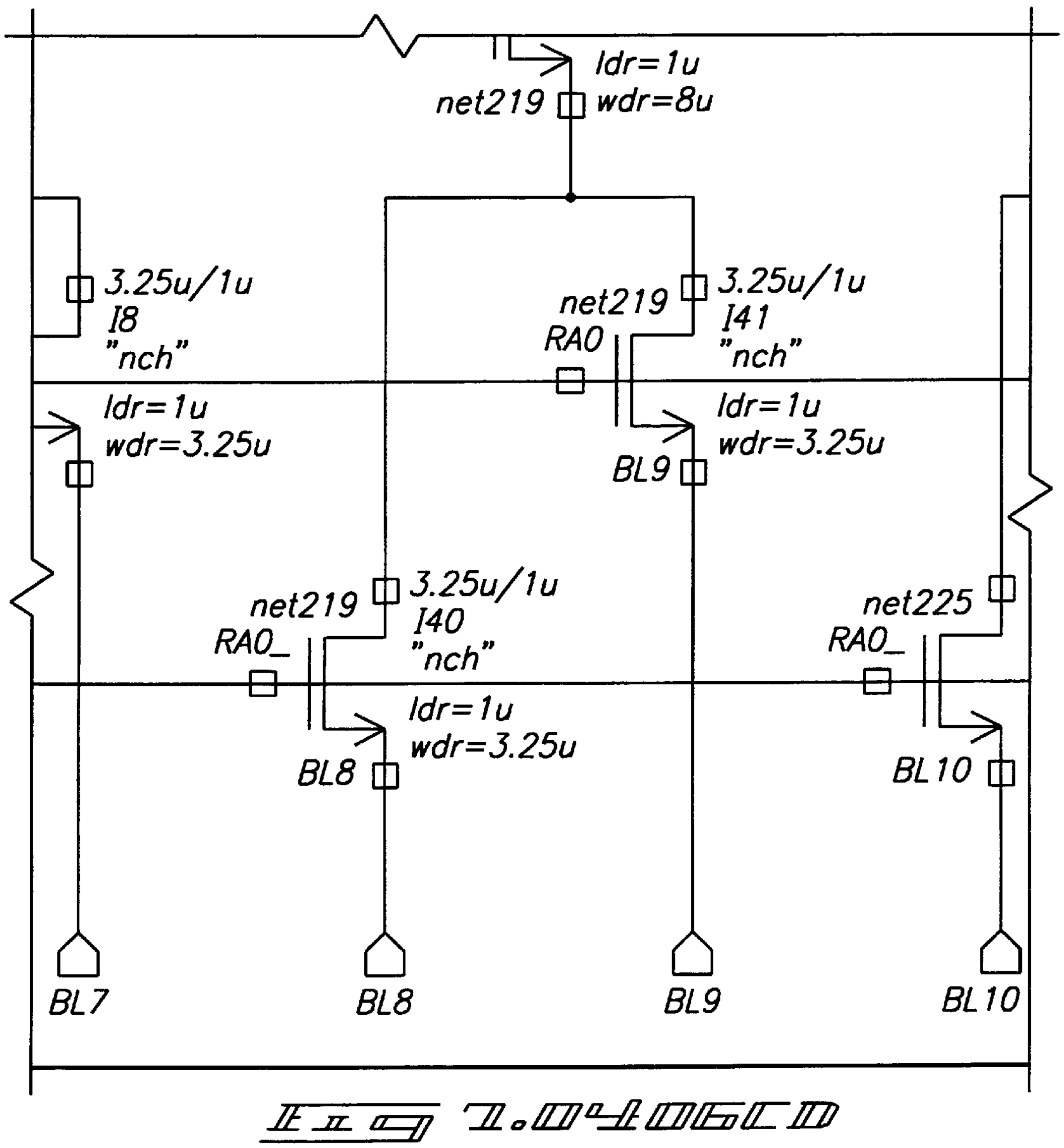
Fig 1.04O6CD

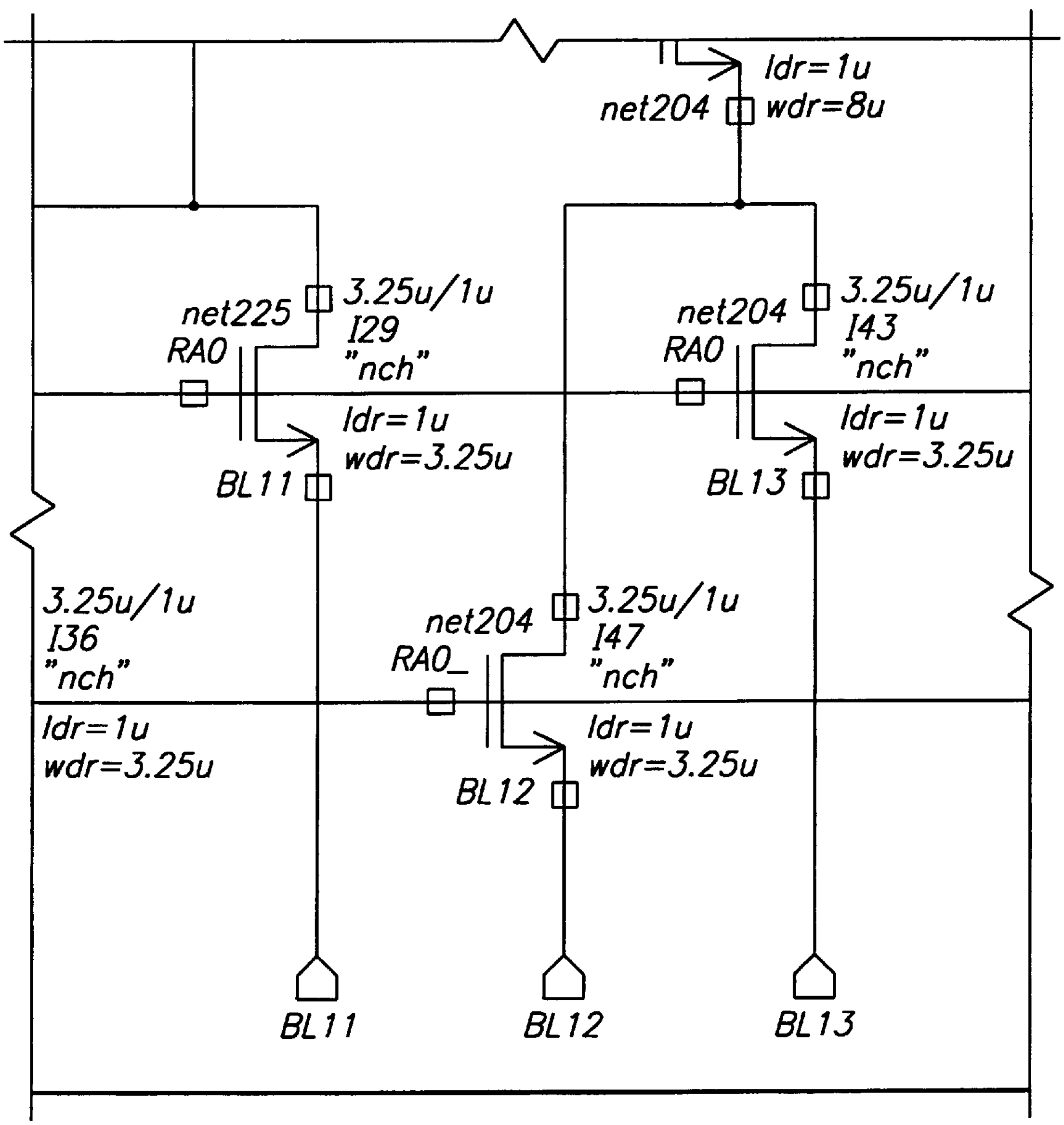
Fig 2.04106CE

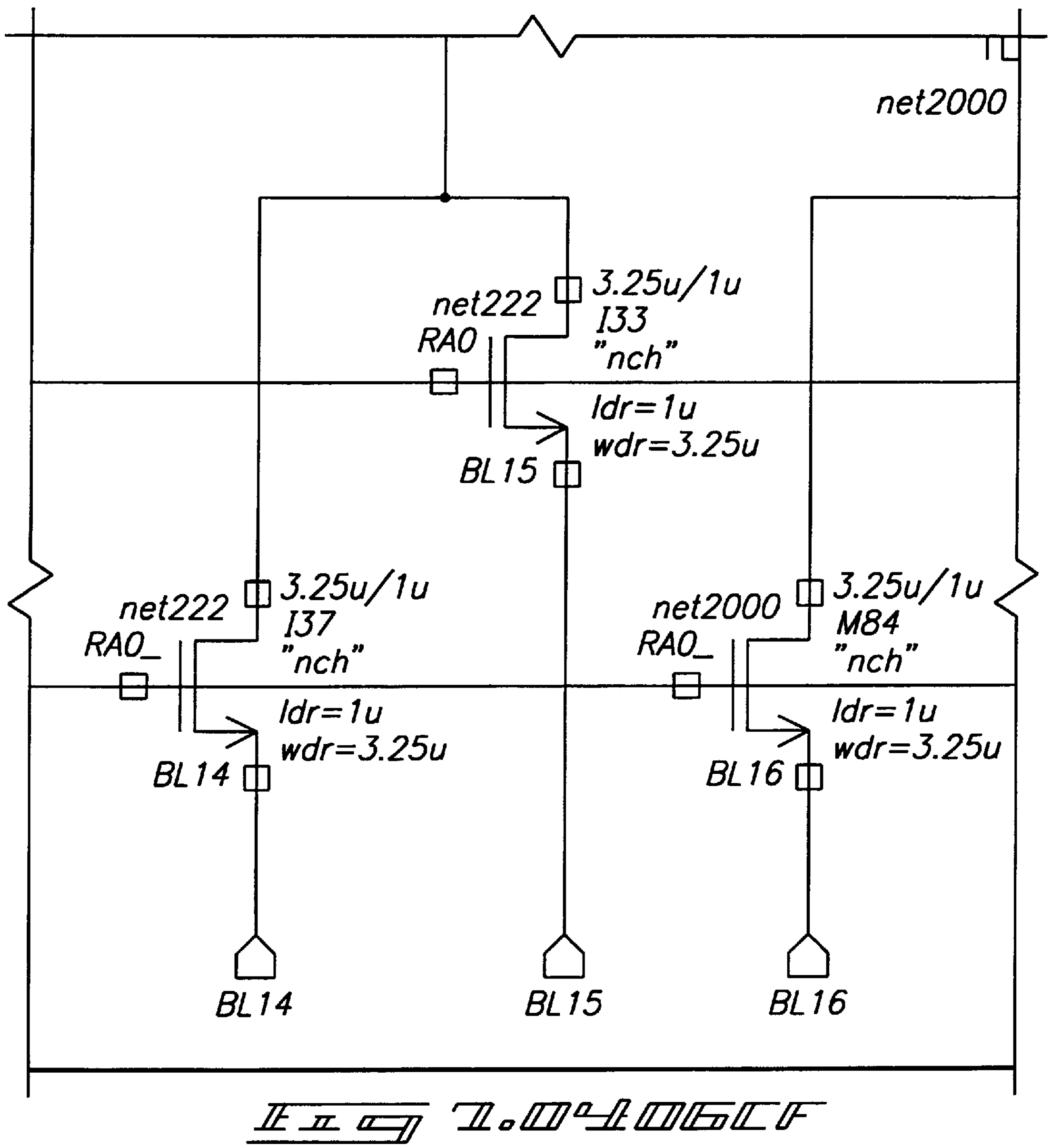
Fig 1.0406CF

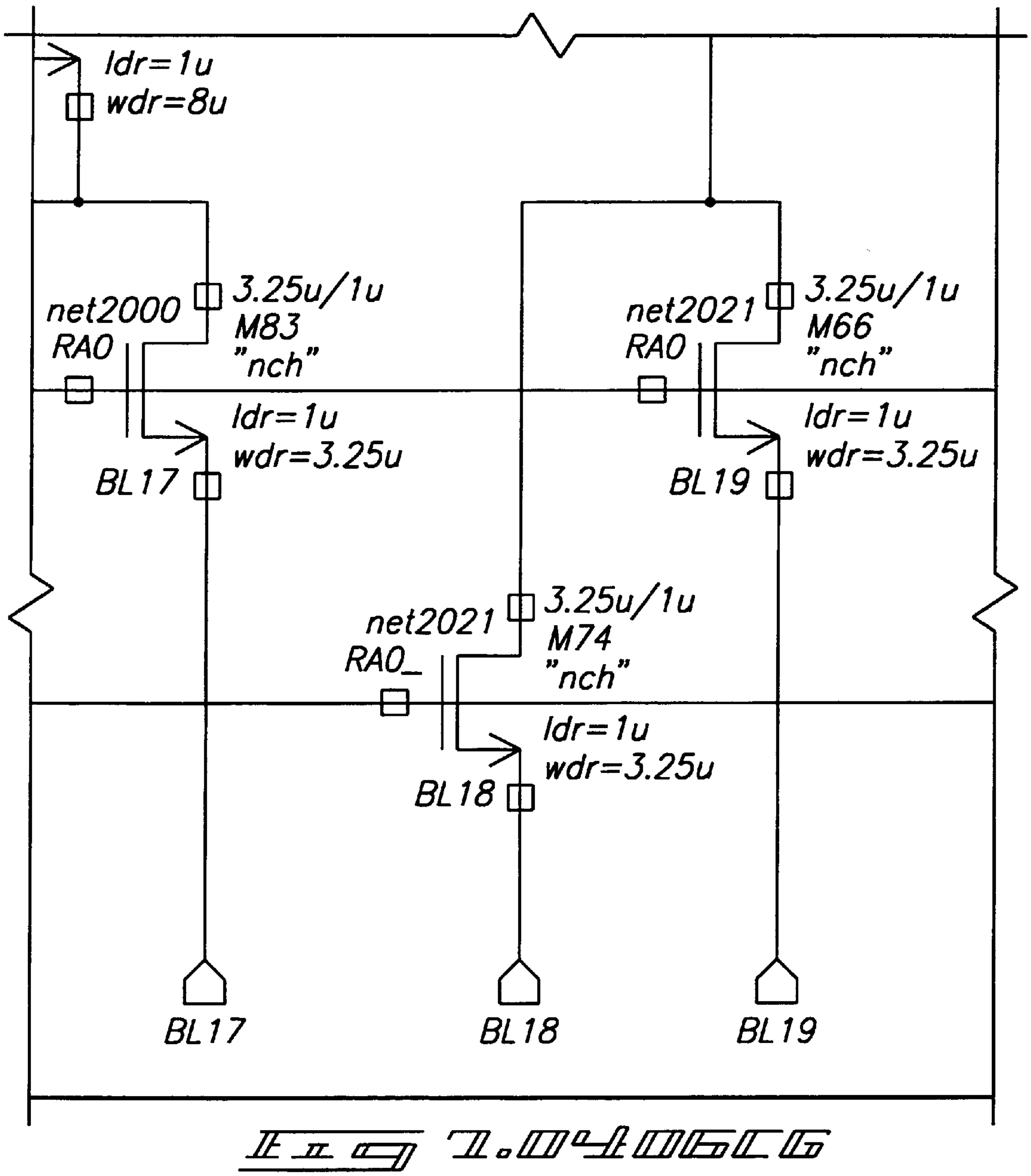
Fig 1.0406CG

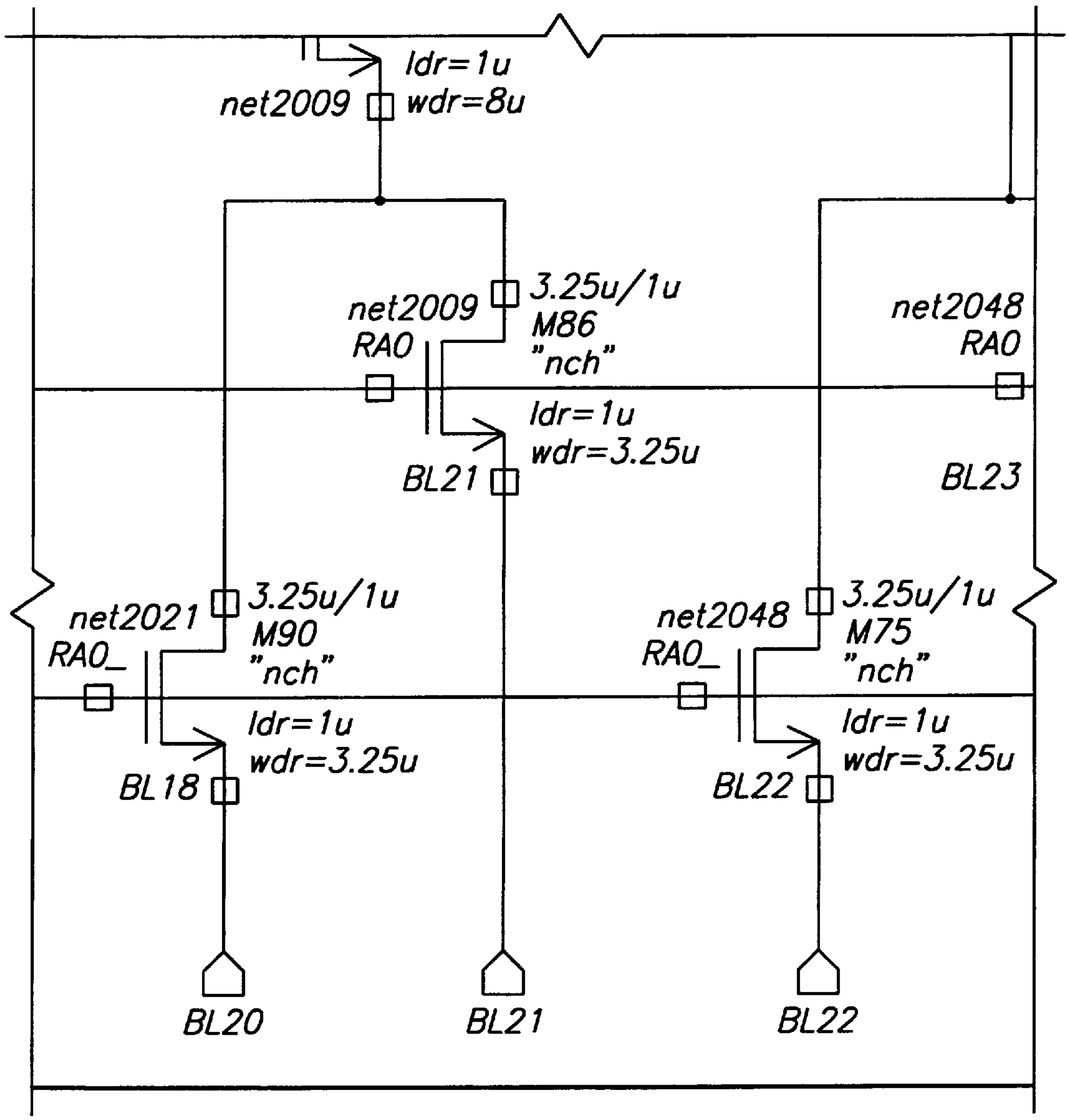
FIG. 7.0406CH

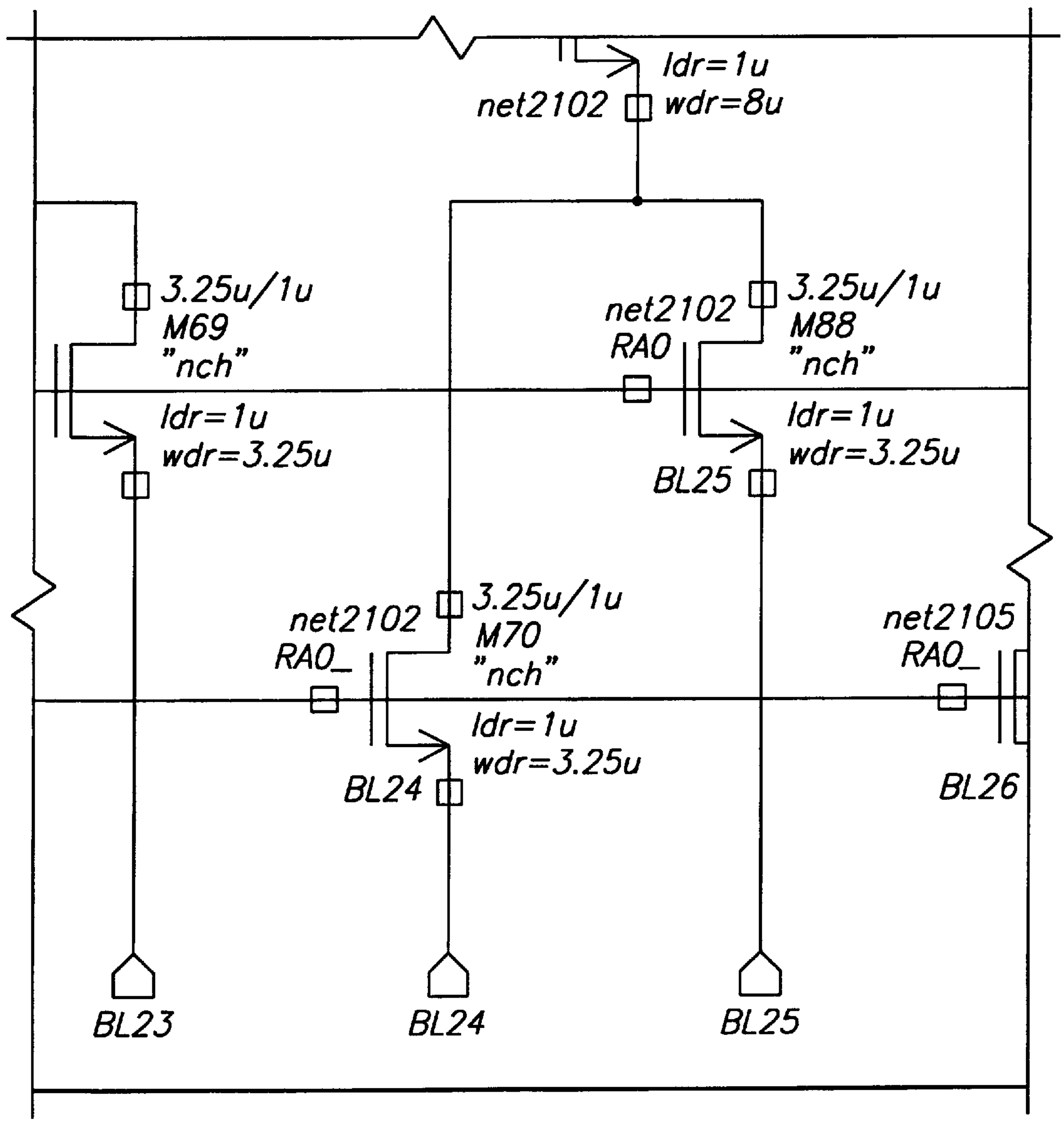
Fig 7.04O6CI

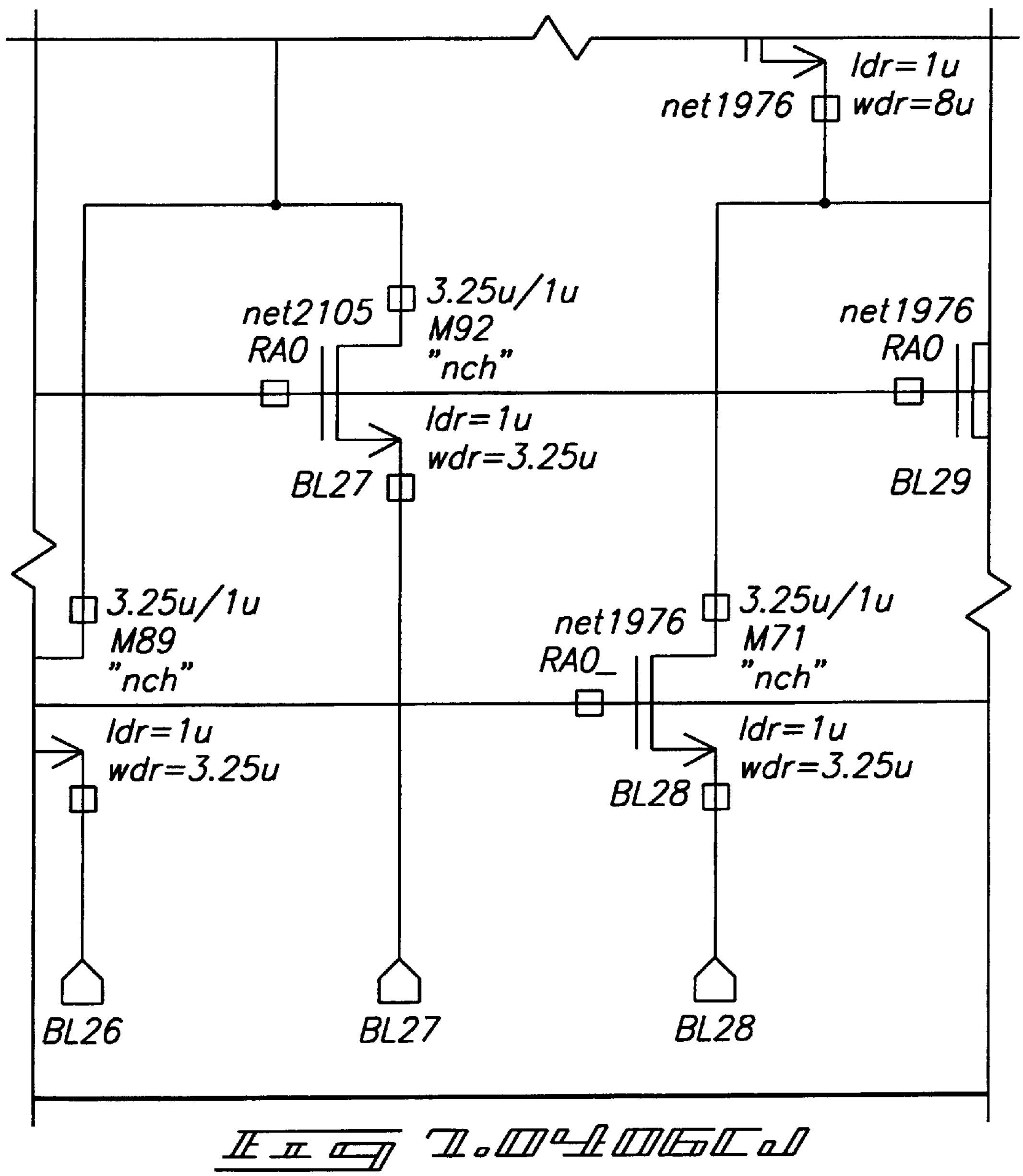
Fig. 7.0406Cd

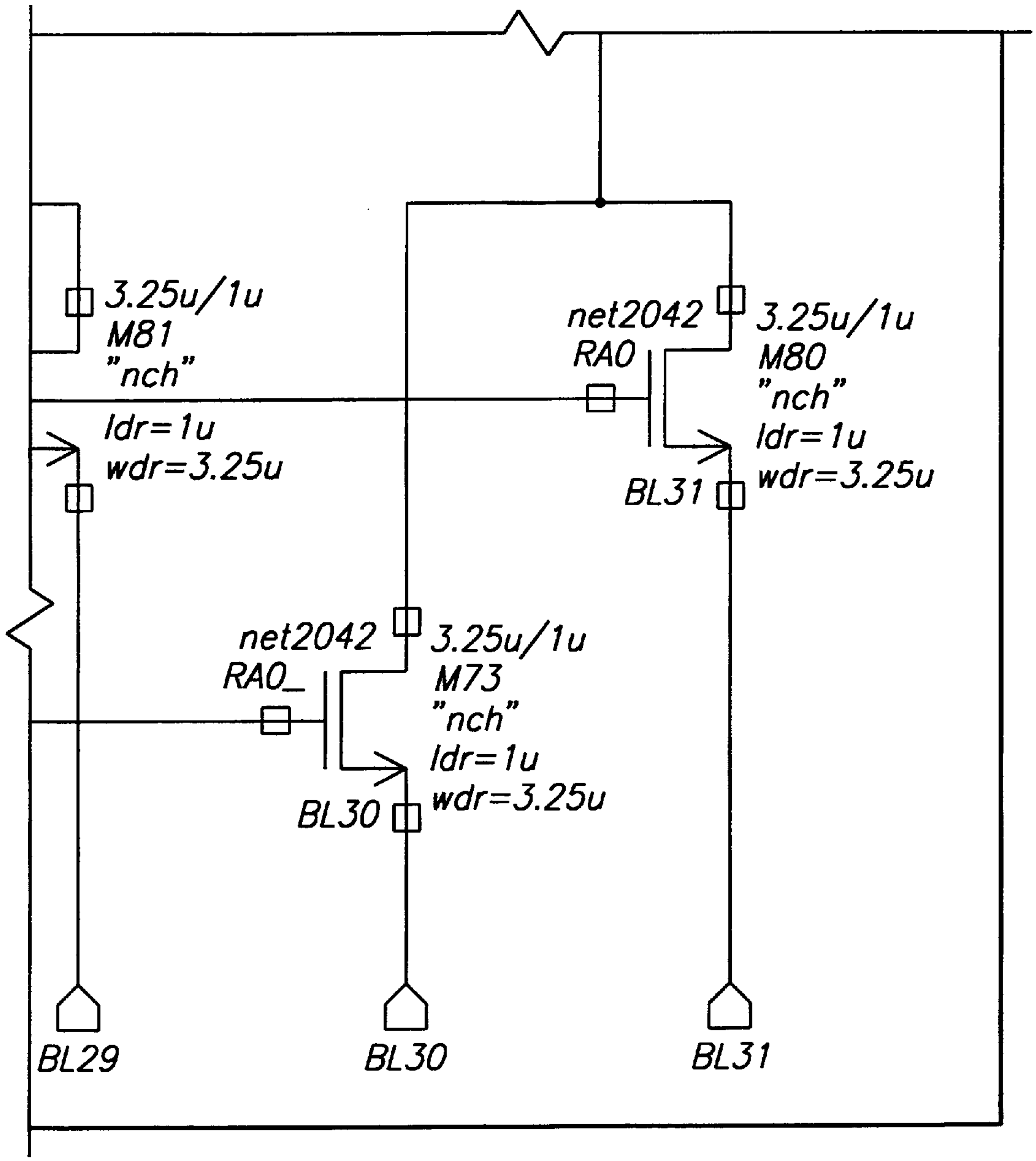
Fig. 1.0406CK

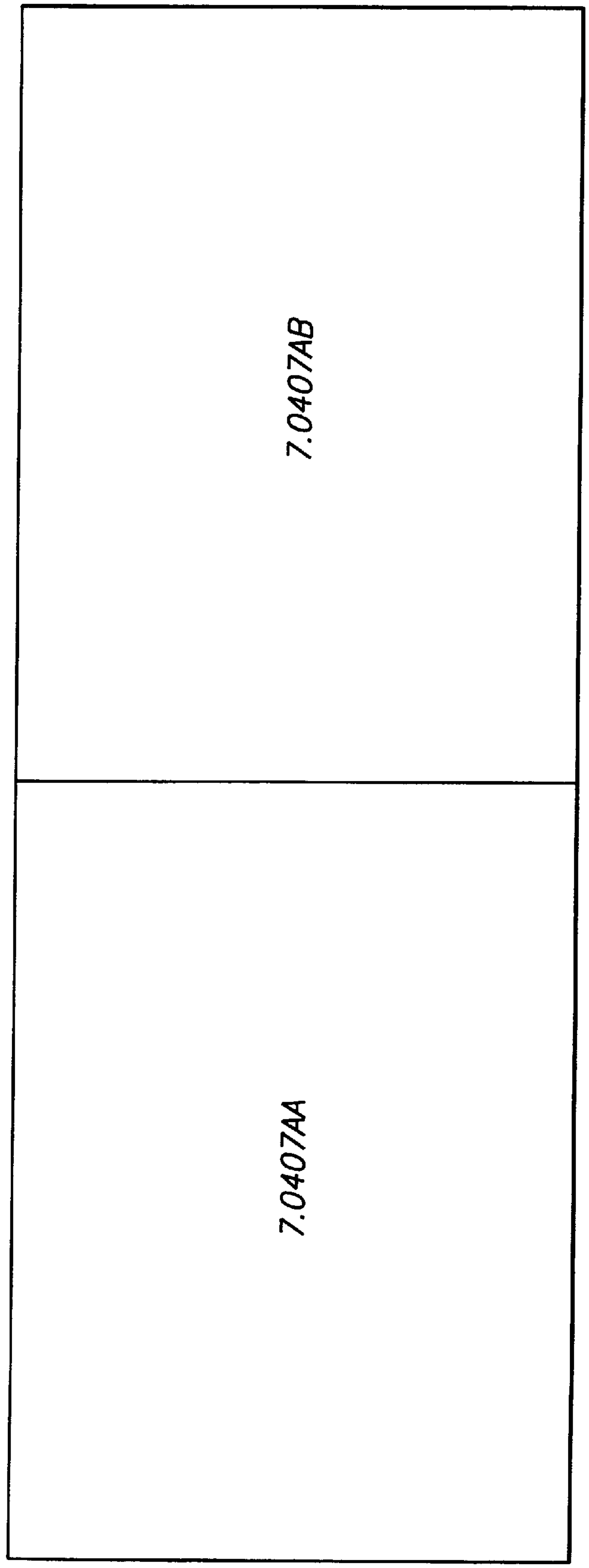
FIG. 7.0407A

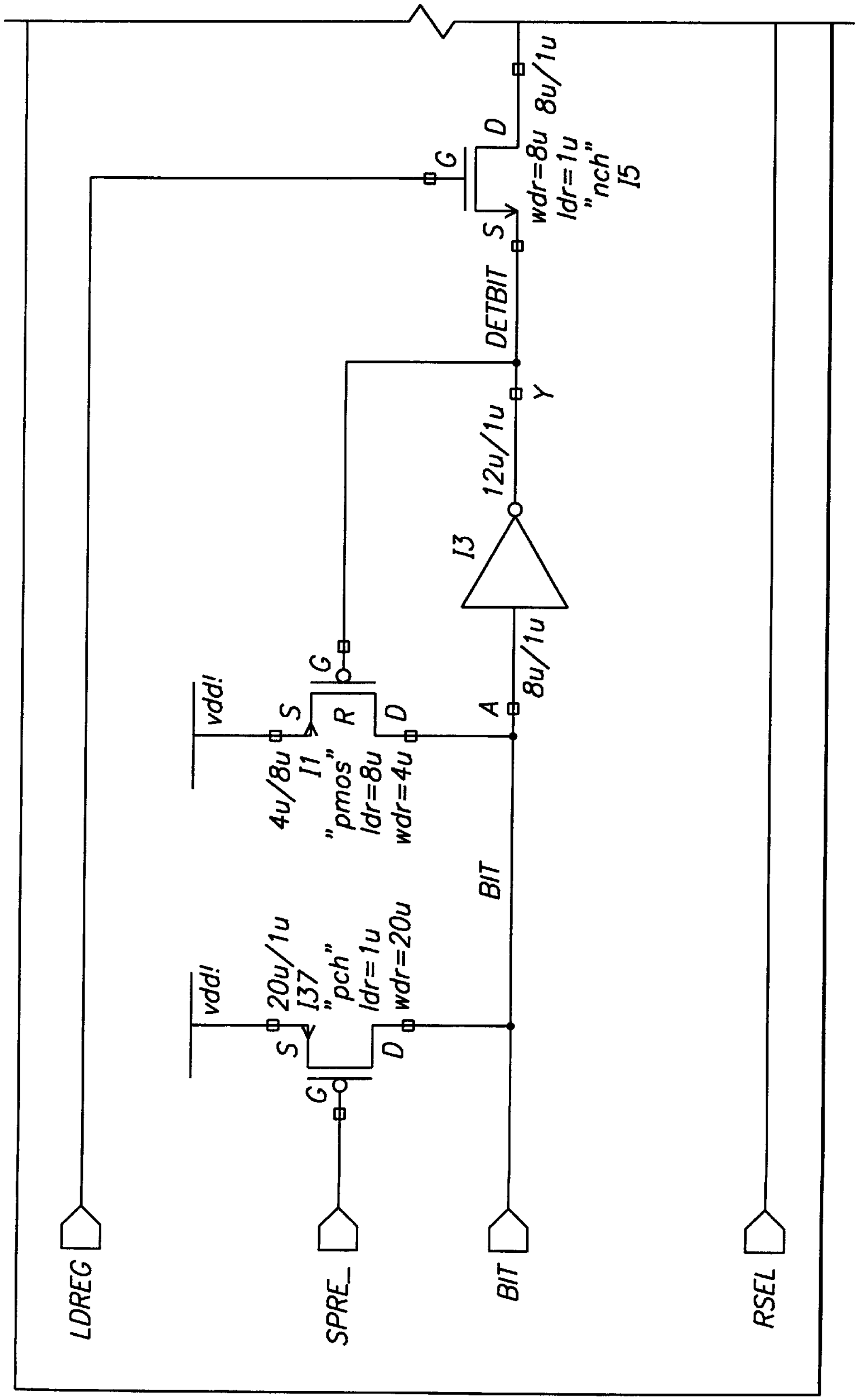
FIG. 7.0401AA

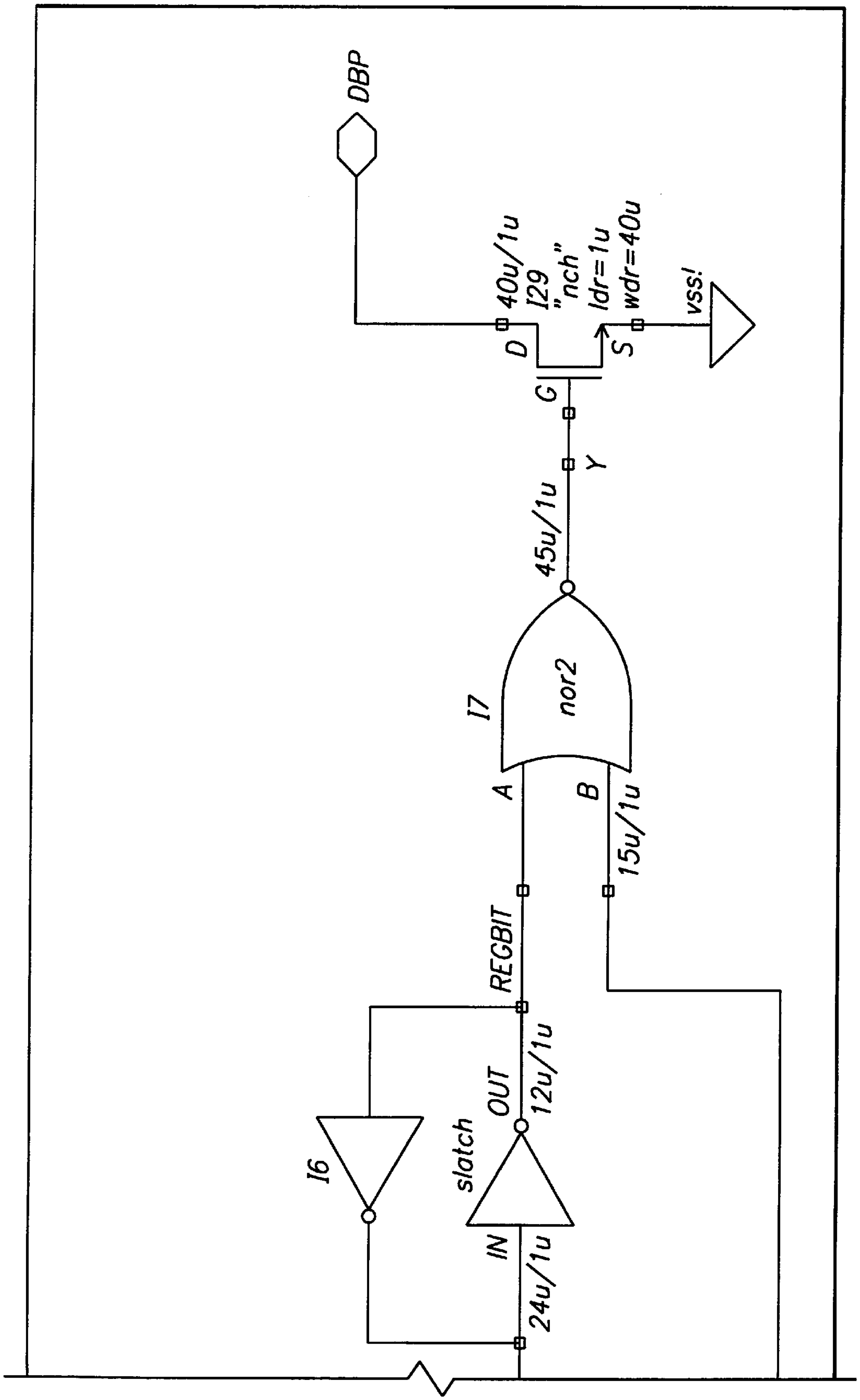
FIG. 7.0.4.07AB

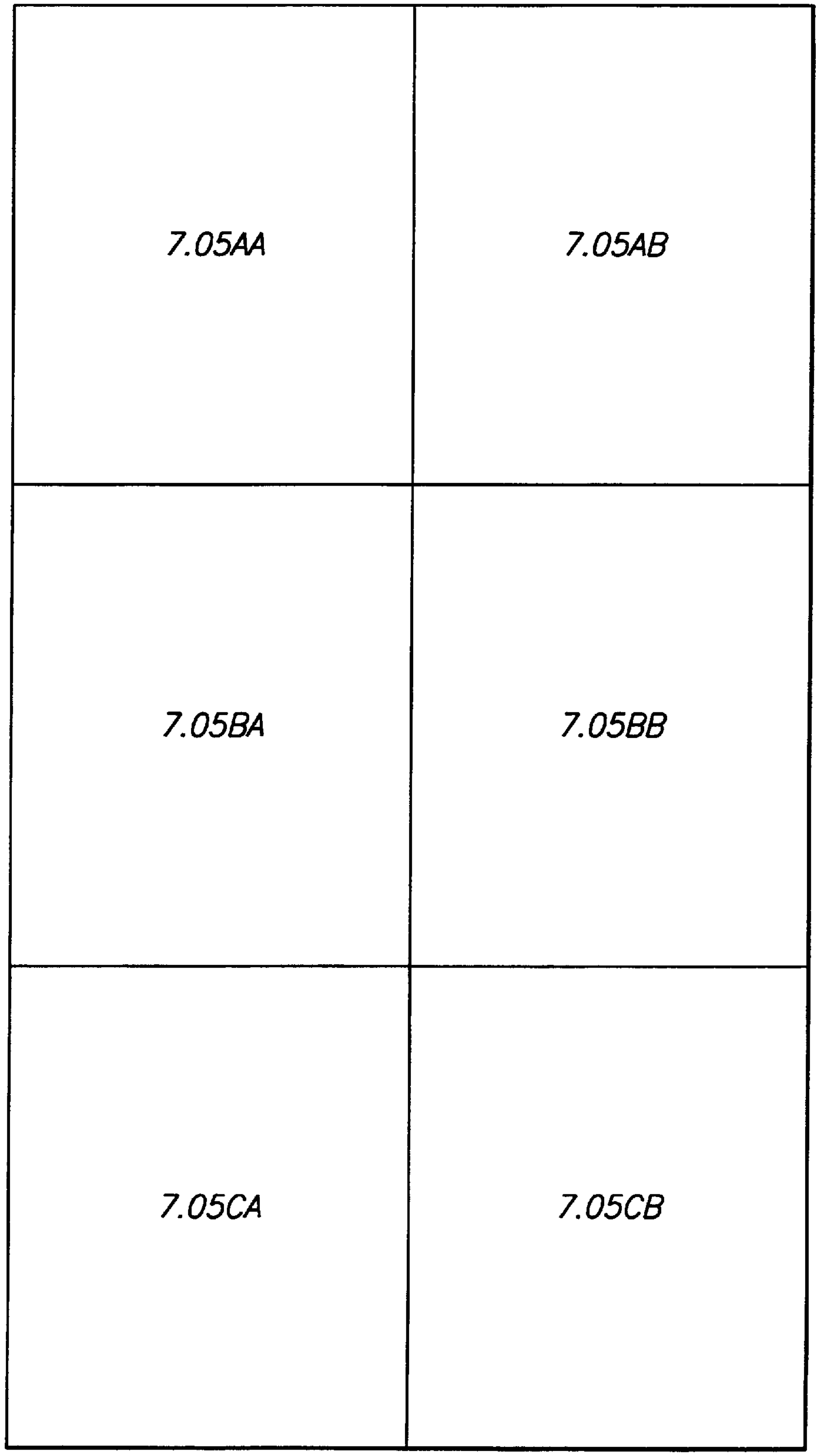
FIG. 7.05

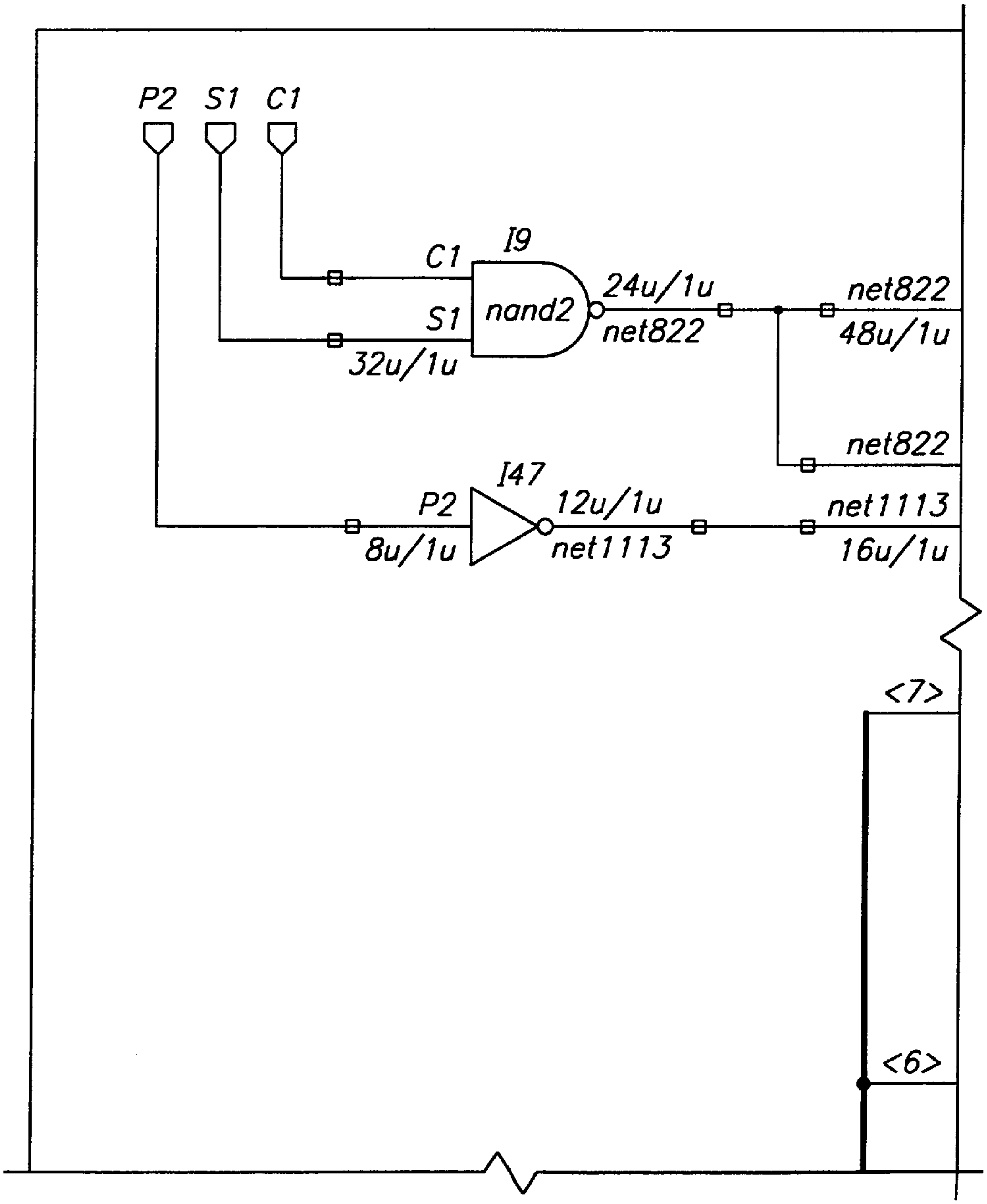
Fig. 1.05AA

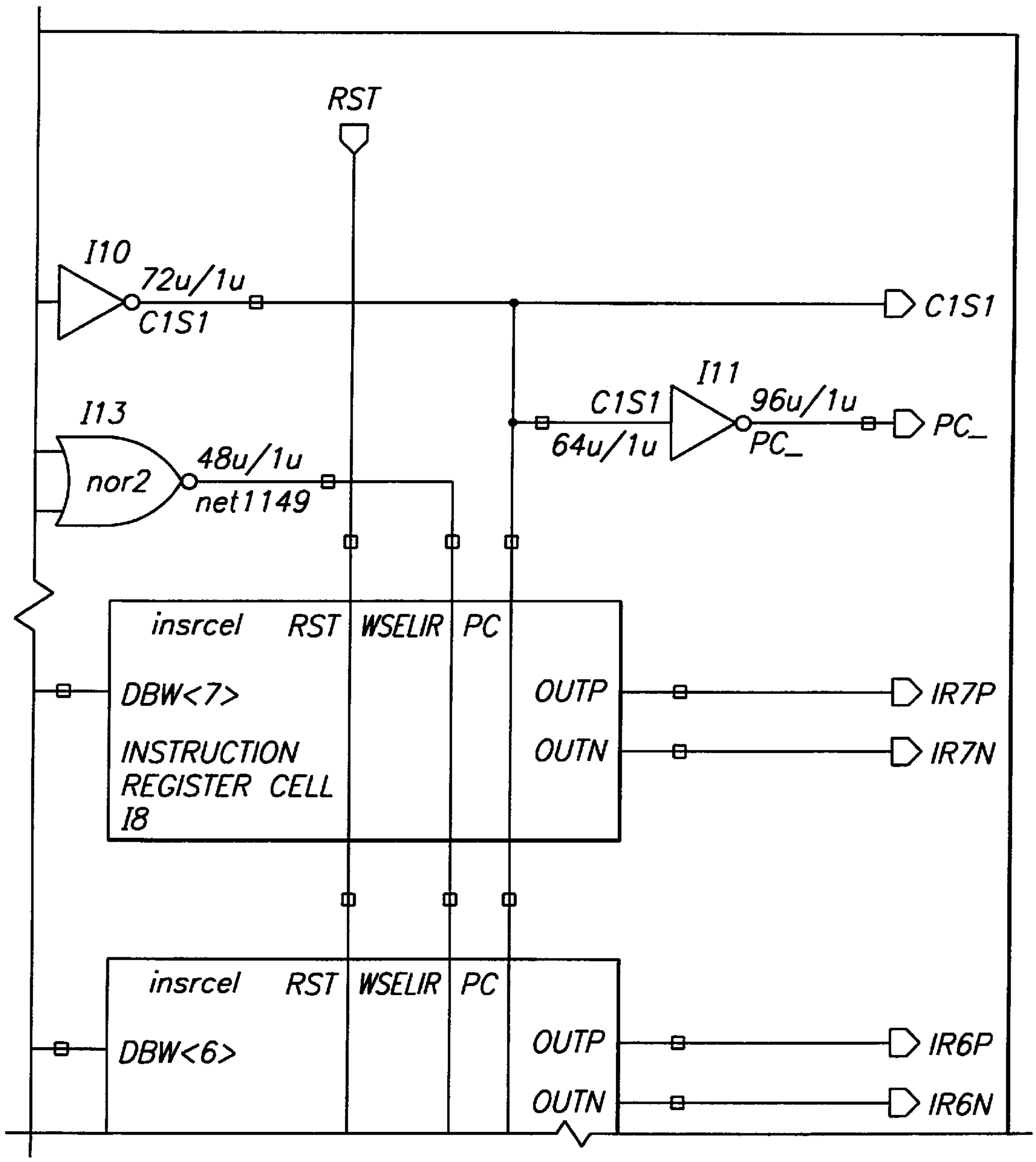
Fig 1.05AB

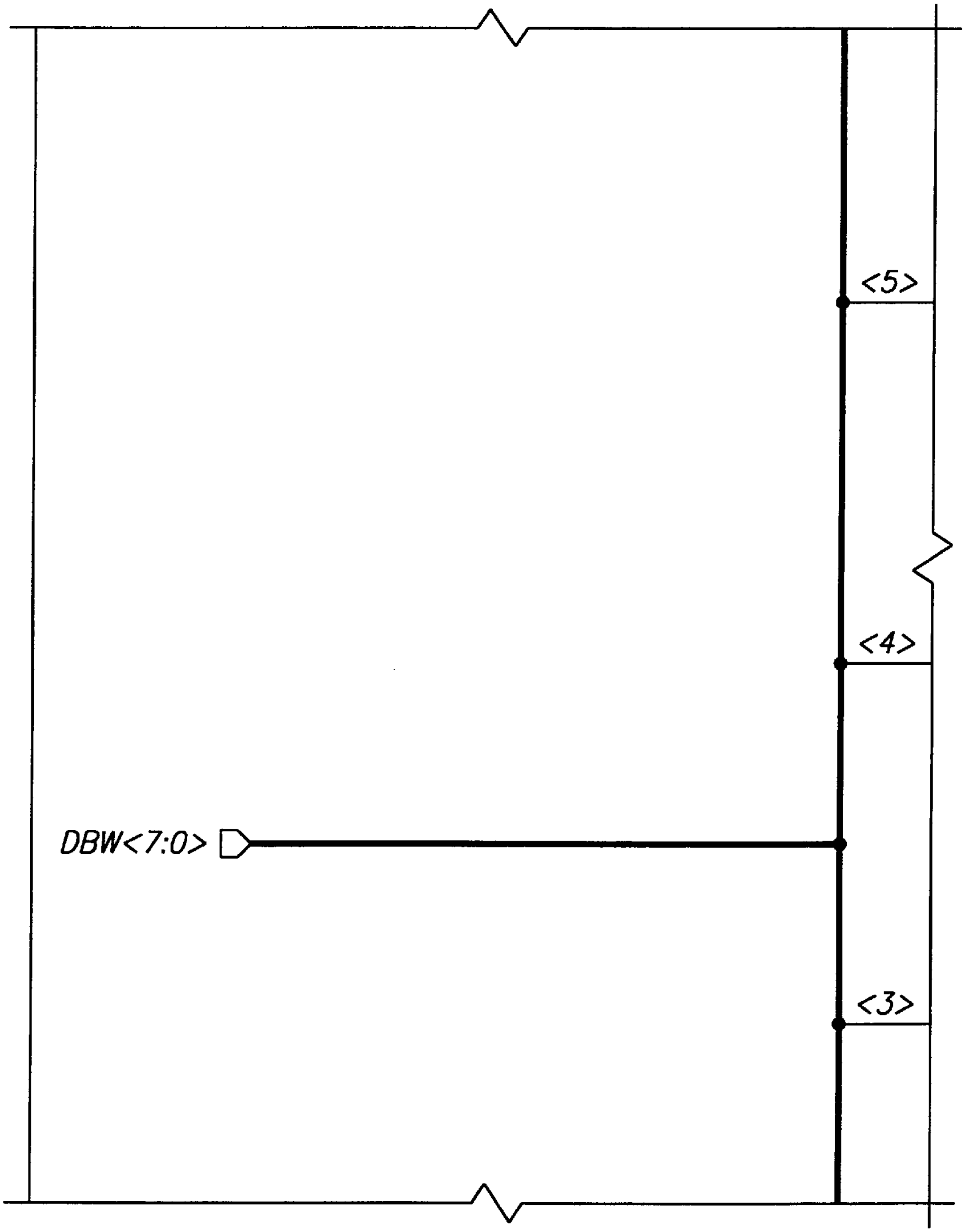
Fig 7.05BA

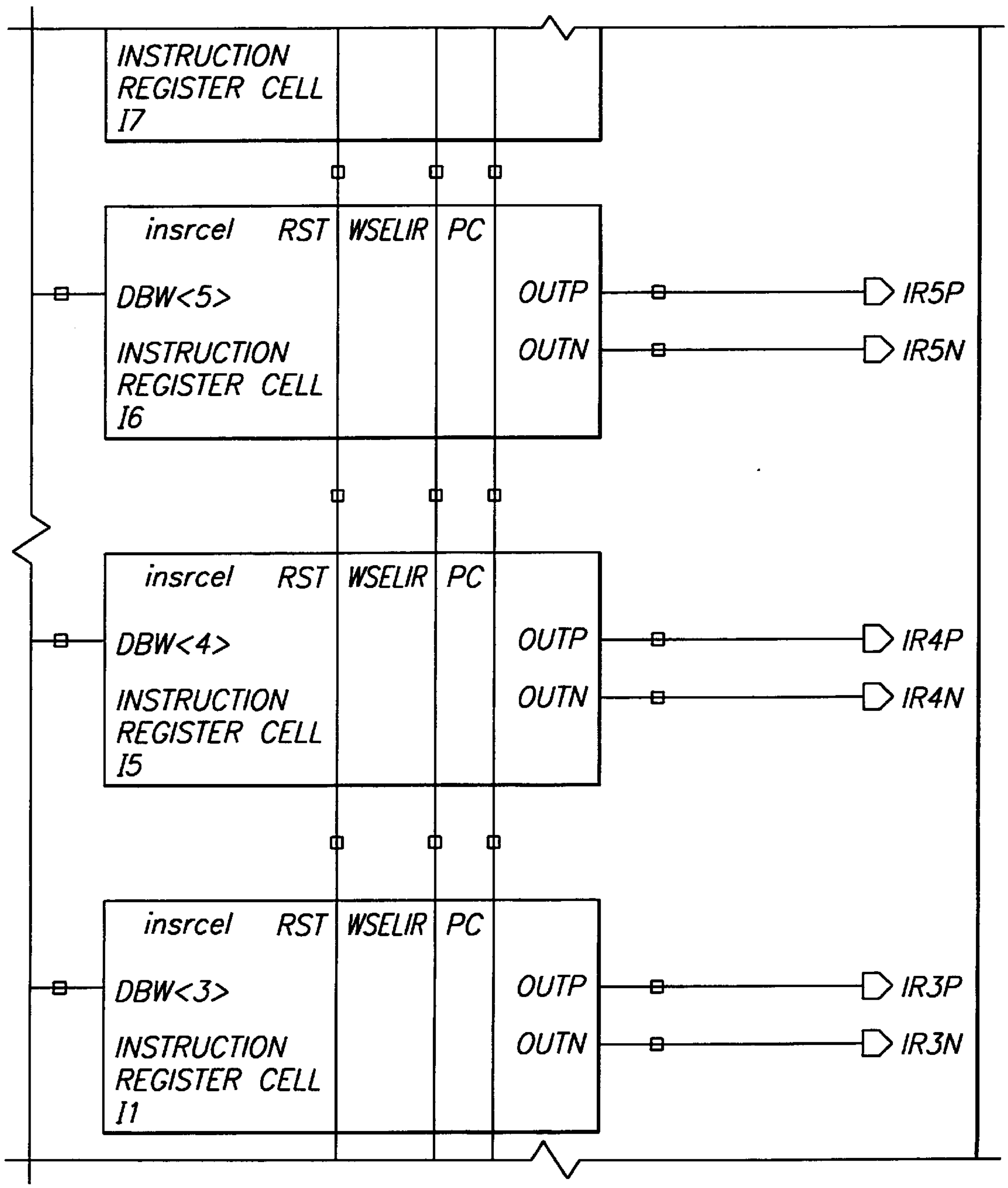
Fig. 1.05BB

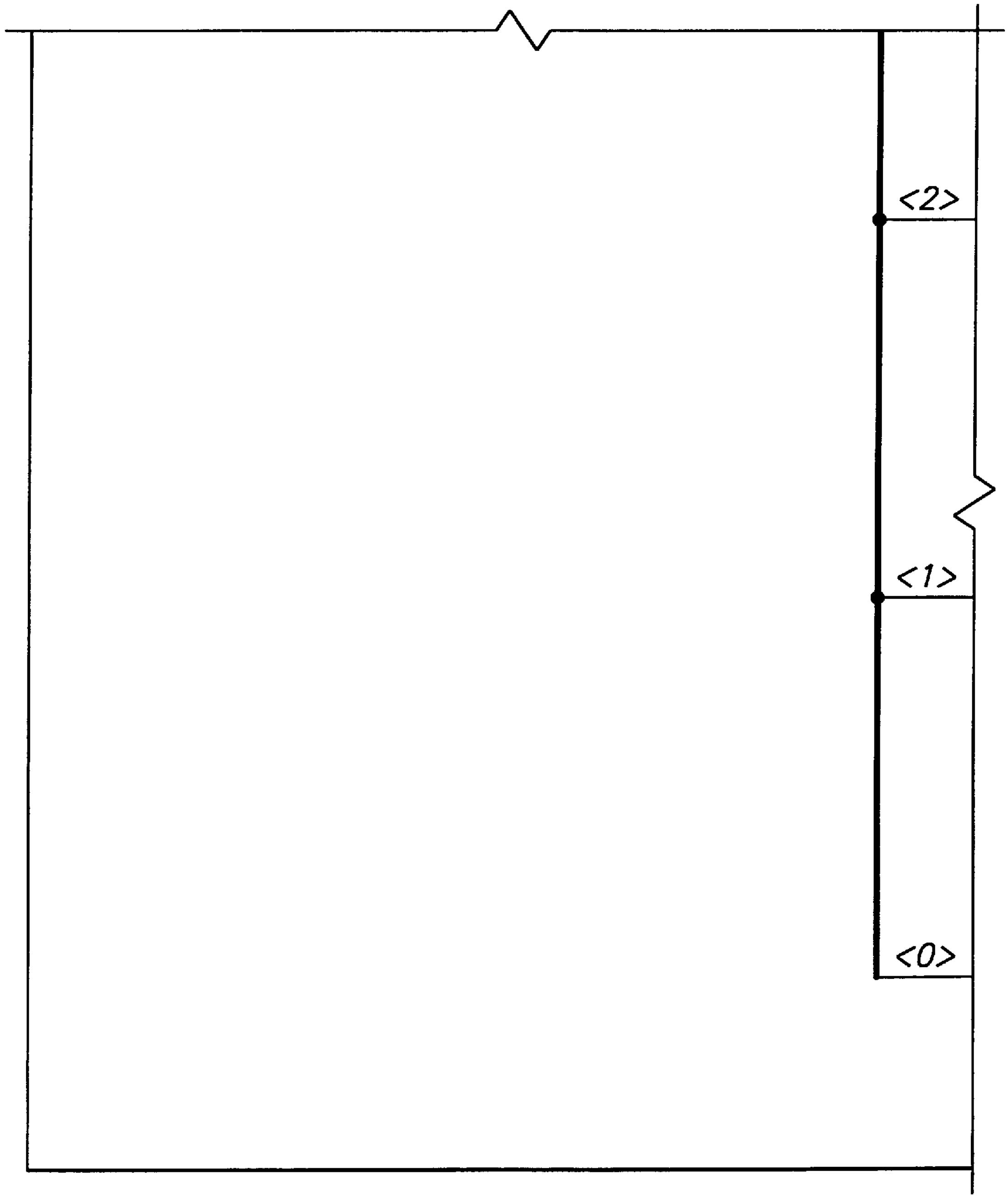
Fig 7.05CA

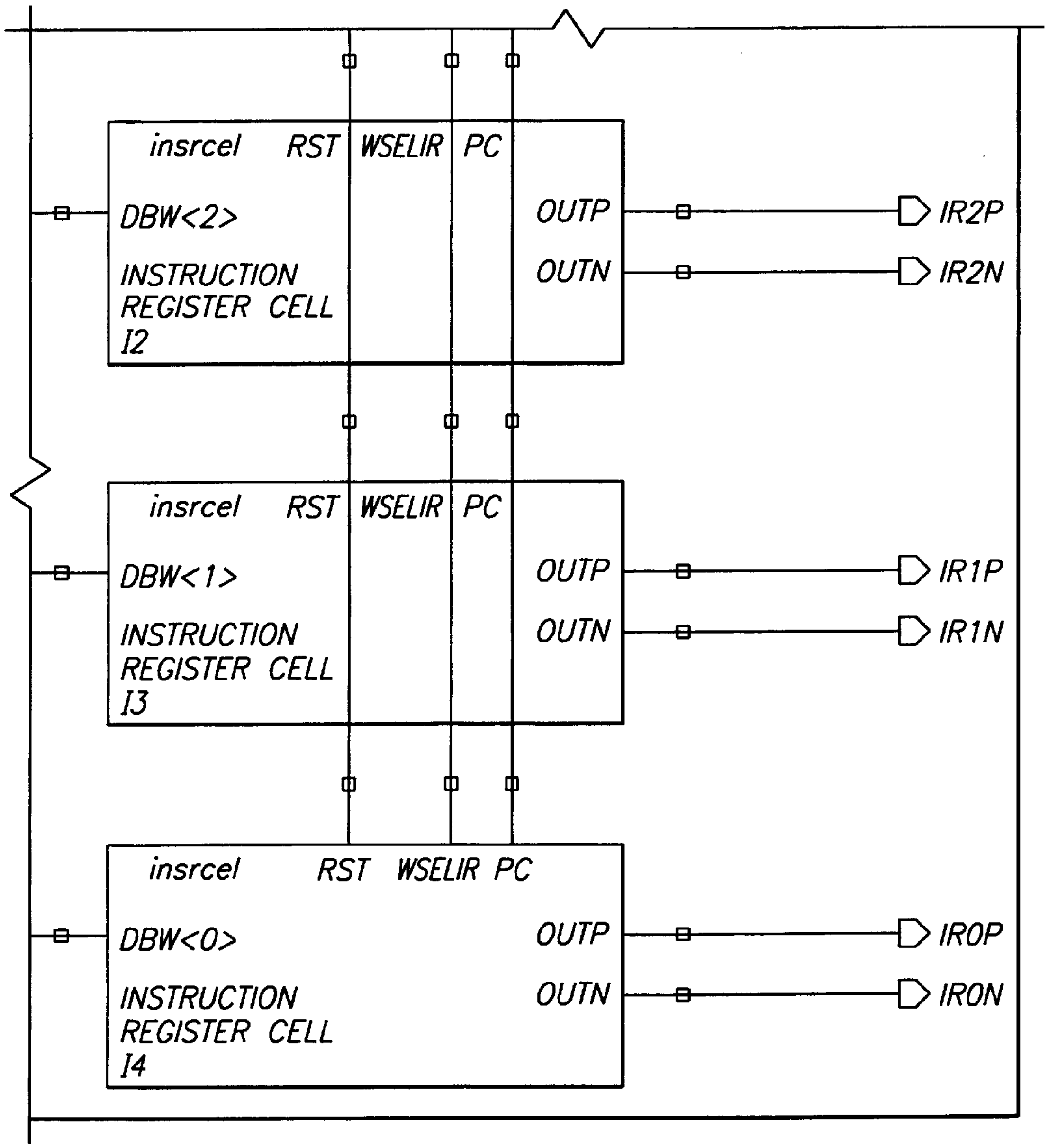
Fig. 1.05CB

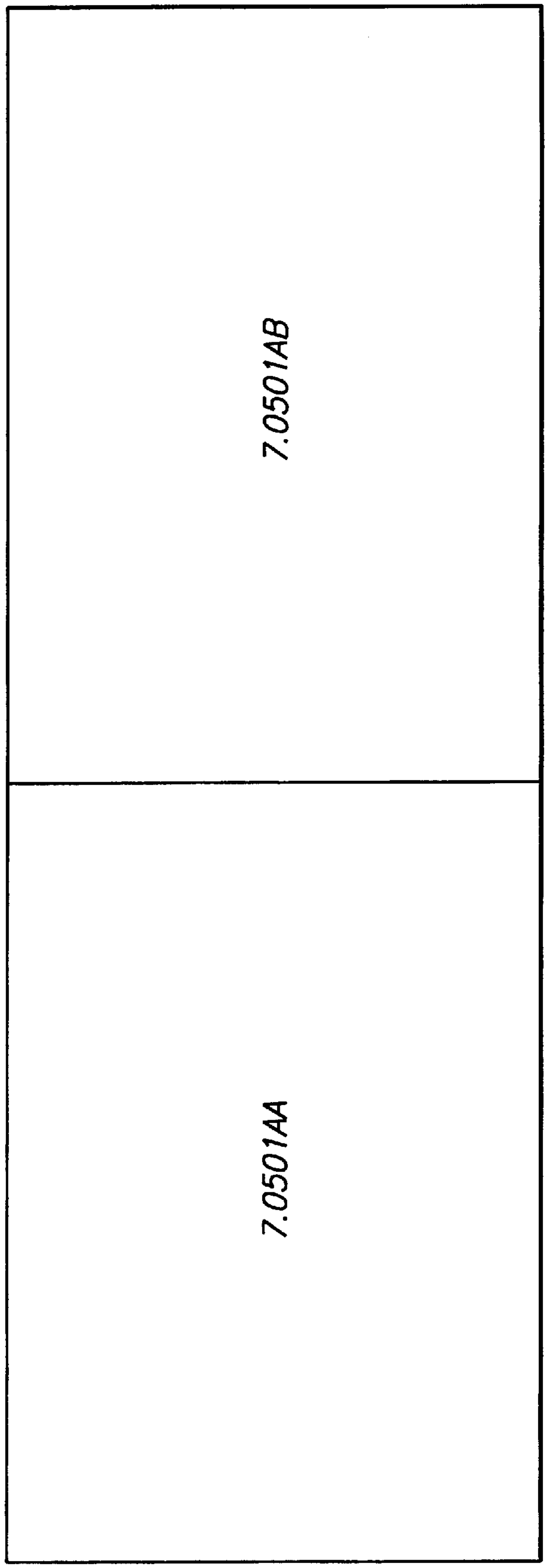
FIG. 7.0501

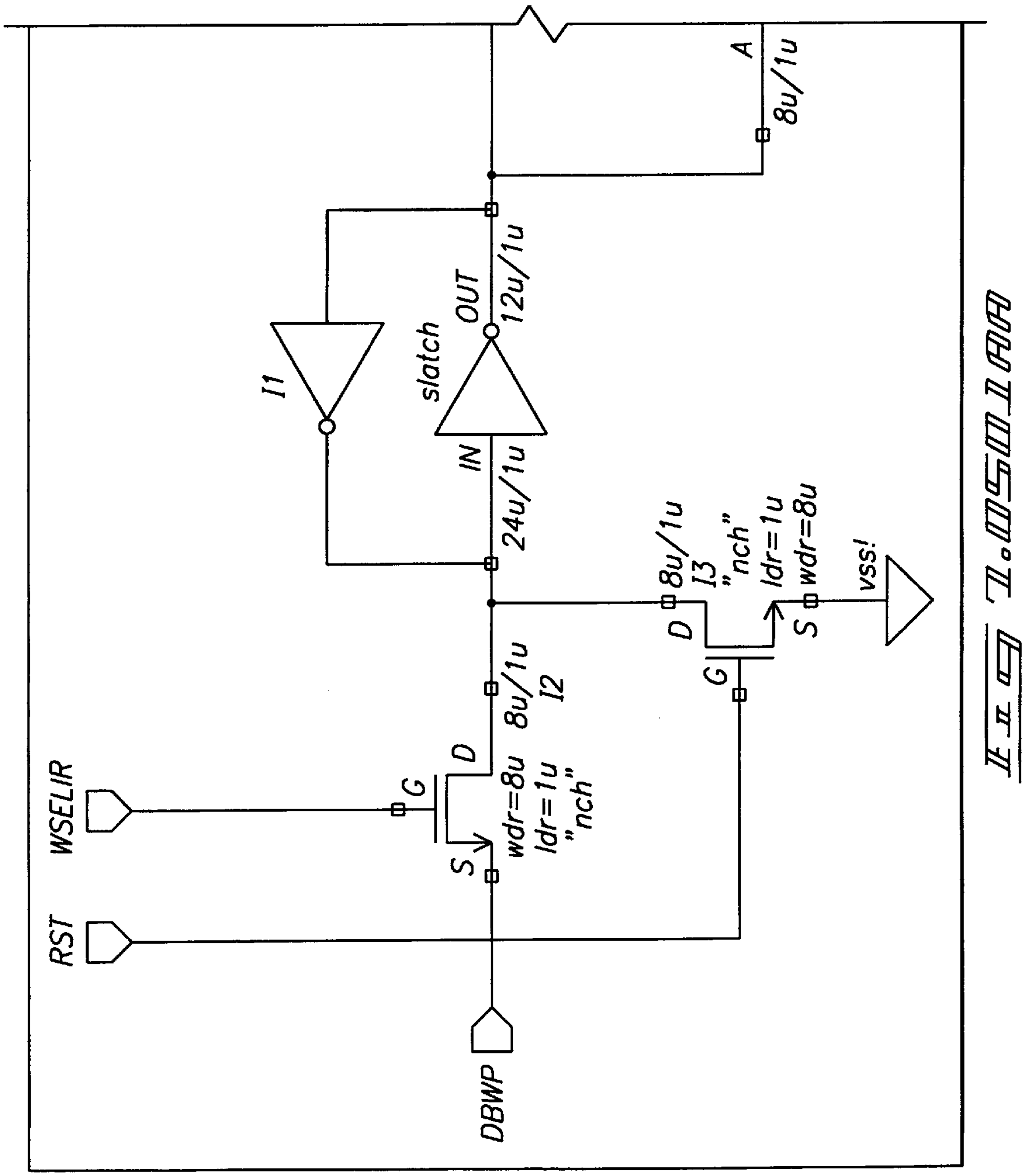
Fig 7.050.1AA

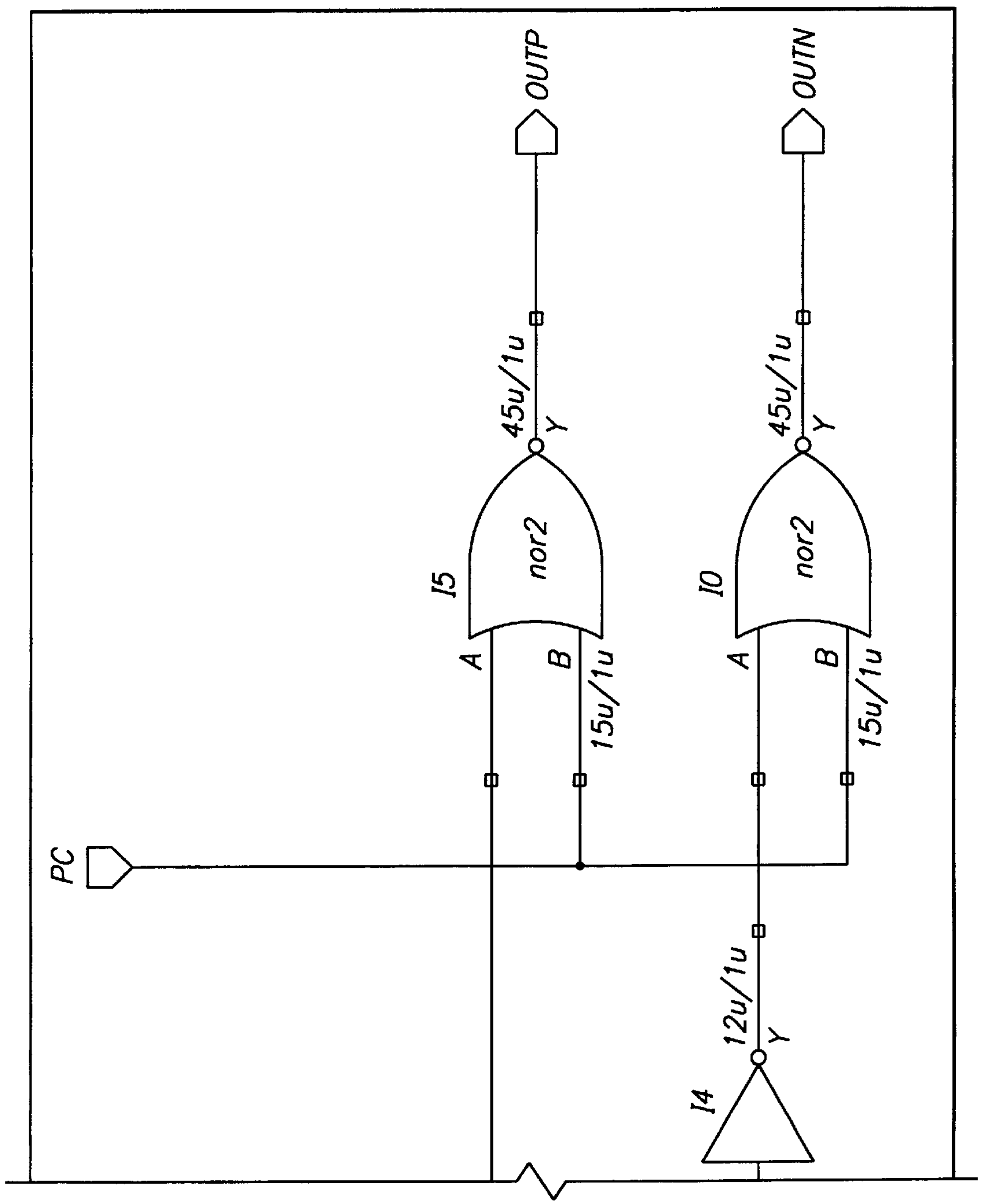
FIG. 7.0501AB

| | | | | | | | | | | | | | |
|---|---|---|---|---|---|---|---|---|---|---|---|---|---|
| 7.06AA | 7.06AB | 7.06AC | 7.06AD | 7.06AE | 7.06AF | 7.06AG | 7.06AH | 7.06AI | 7.06AJ | 7.06AK | 7.06AL | 7.06AM | 7.06AN |
| | 7.06BB | 7.06BC | 7.06BD | 7.06BE | 7.06BF | 7.06BG | 7.06BH | 7.06BI | 7.06BJ | 7.06BK | 7.06BL | 7.06BM | 7.06BN |
| 7.06CA | 7.06CB | 7.06CC | 7.06CD | 7.06CE | 7.06CF | 7.06CG | 7.06CH | 7.06CI | 7.06CJ | 7.06CK | 7.06CL | 7.06CM | 7.06CN |

Fig. 7.06

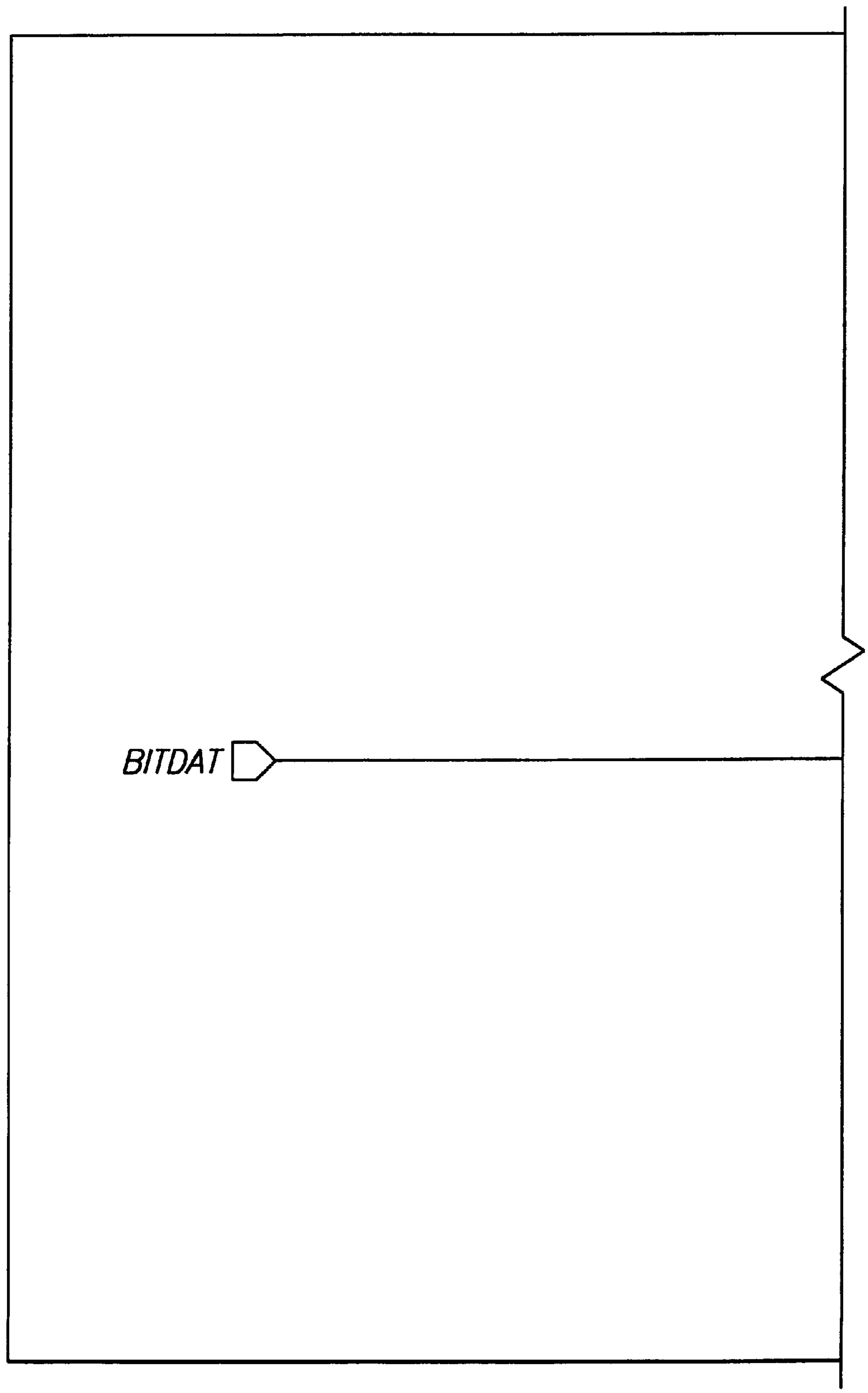
FIG 7.06AA

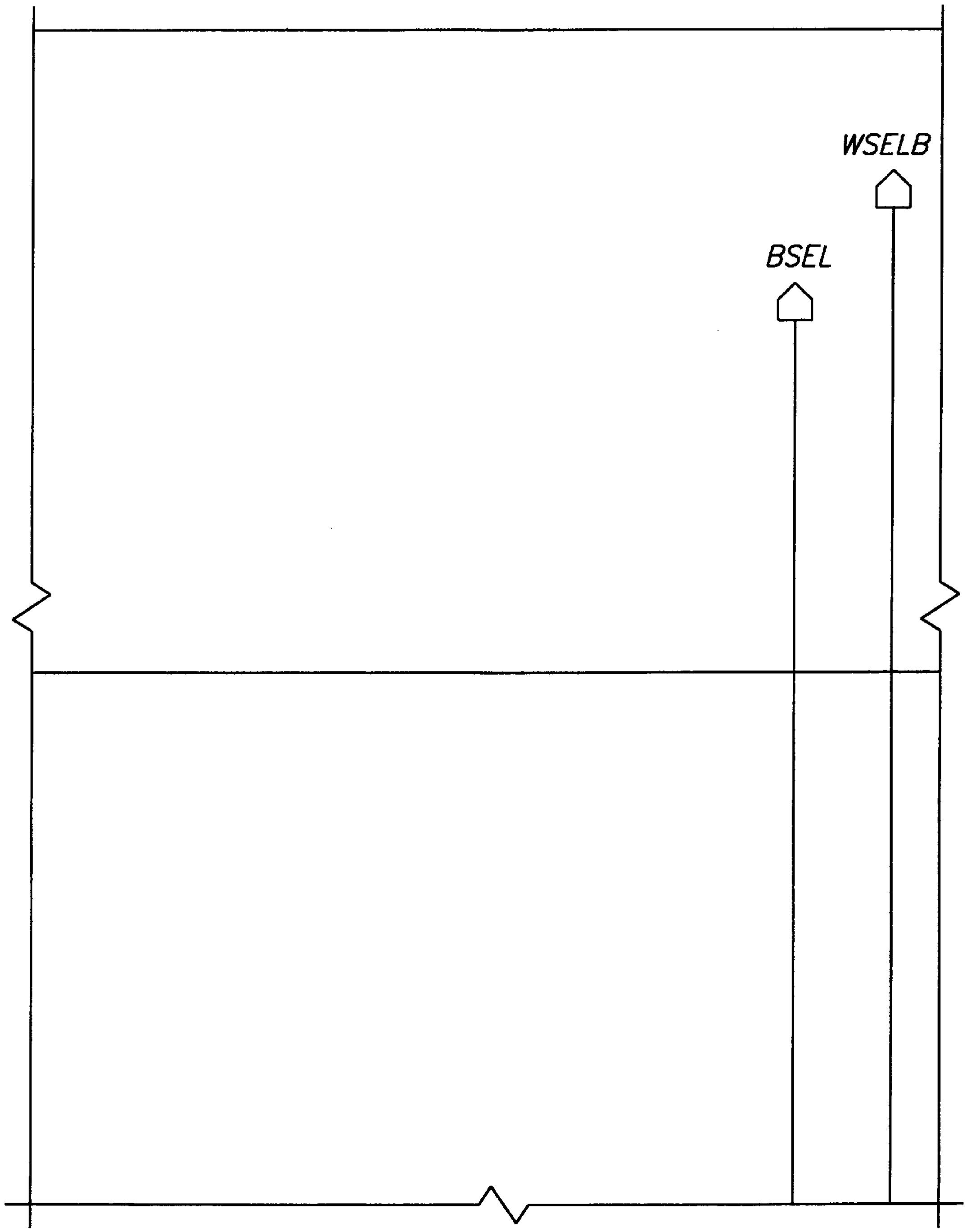
Fig 1.06AB

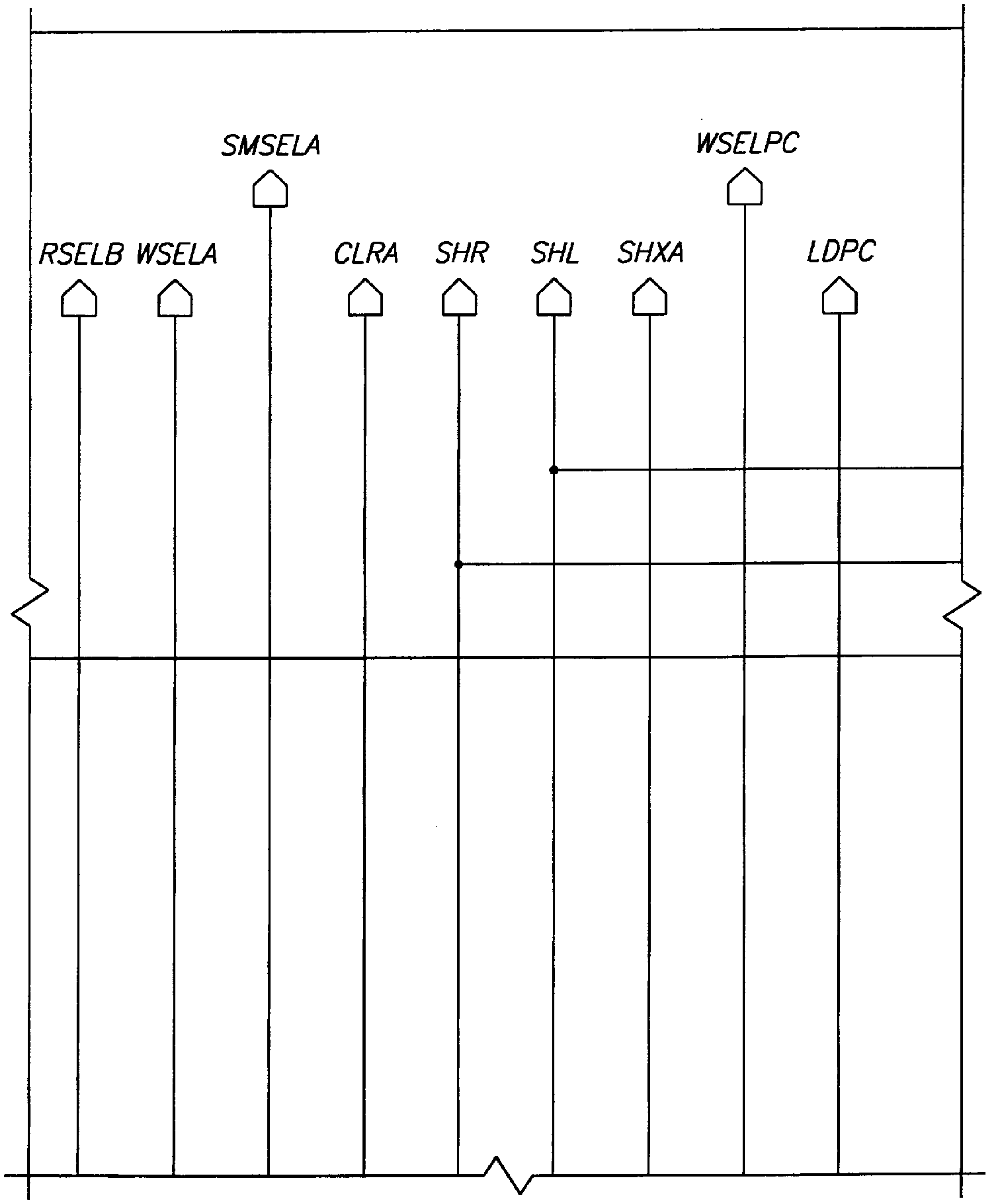
Fig 1.06AC

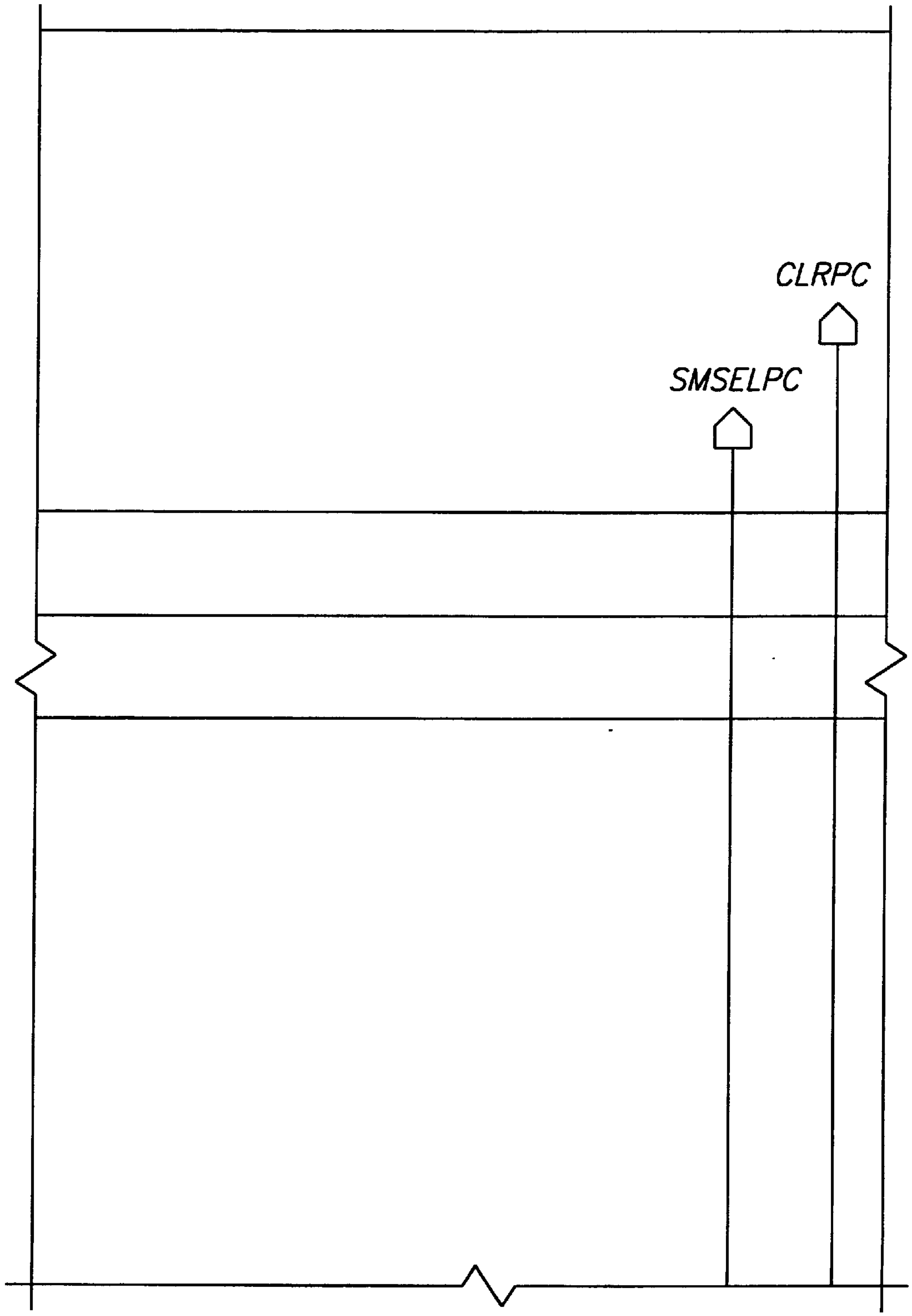
Fig 7.06AD

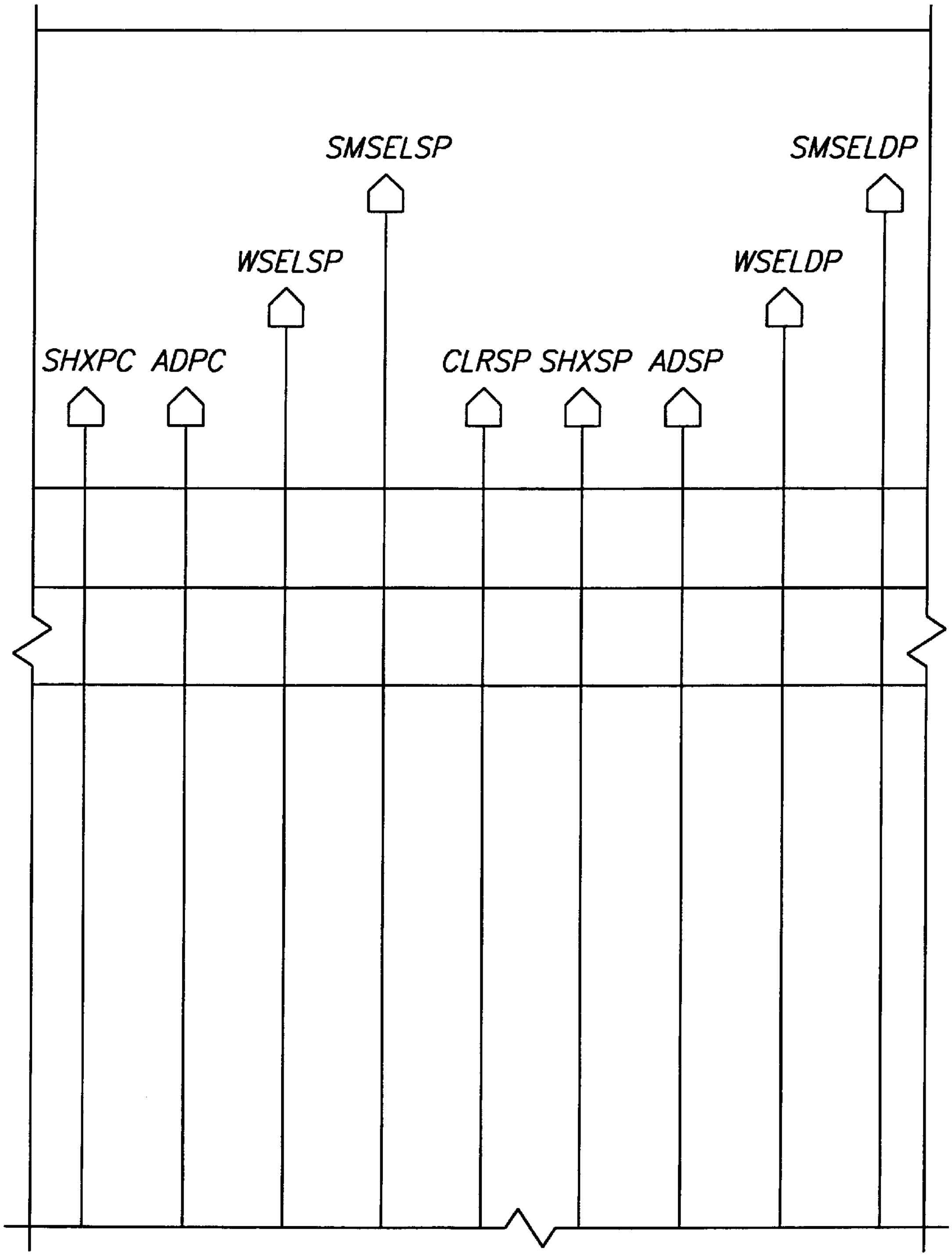
Fig 1.06AE

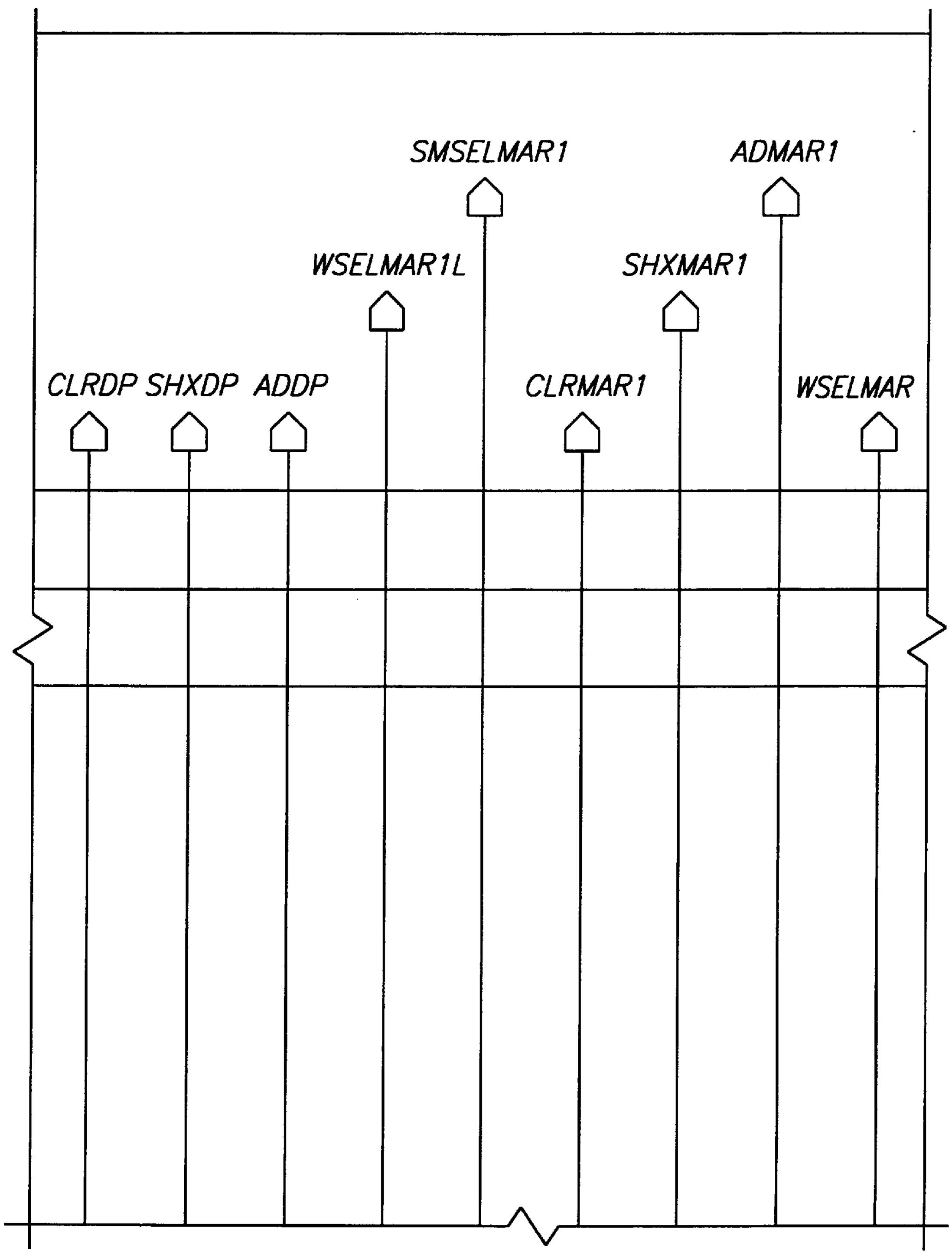
Fig 7.06AF

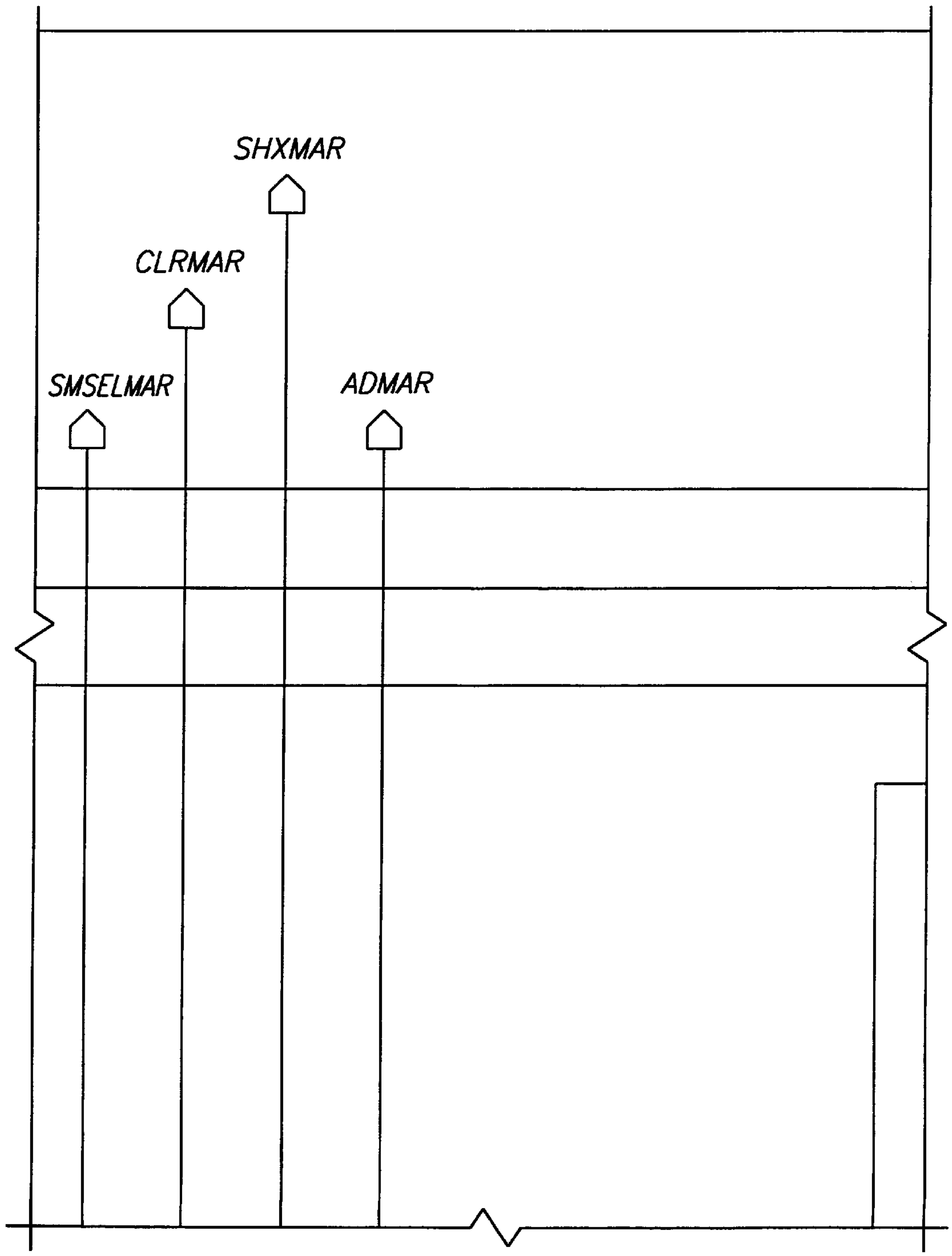
Fig 7.06AG

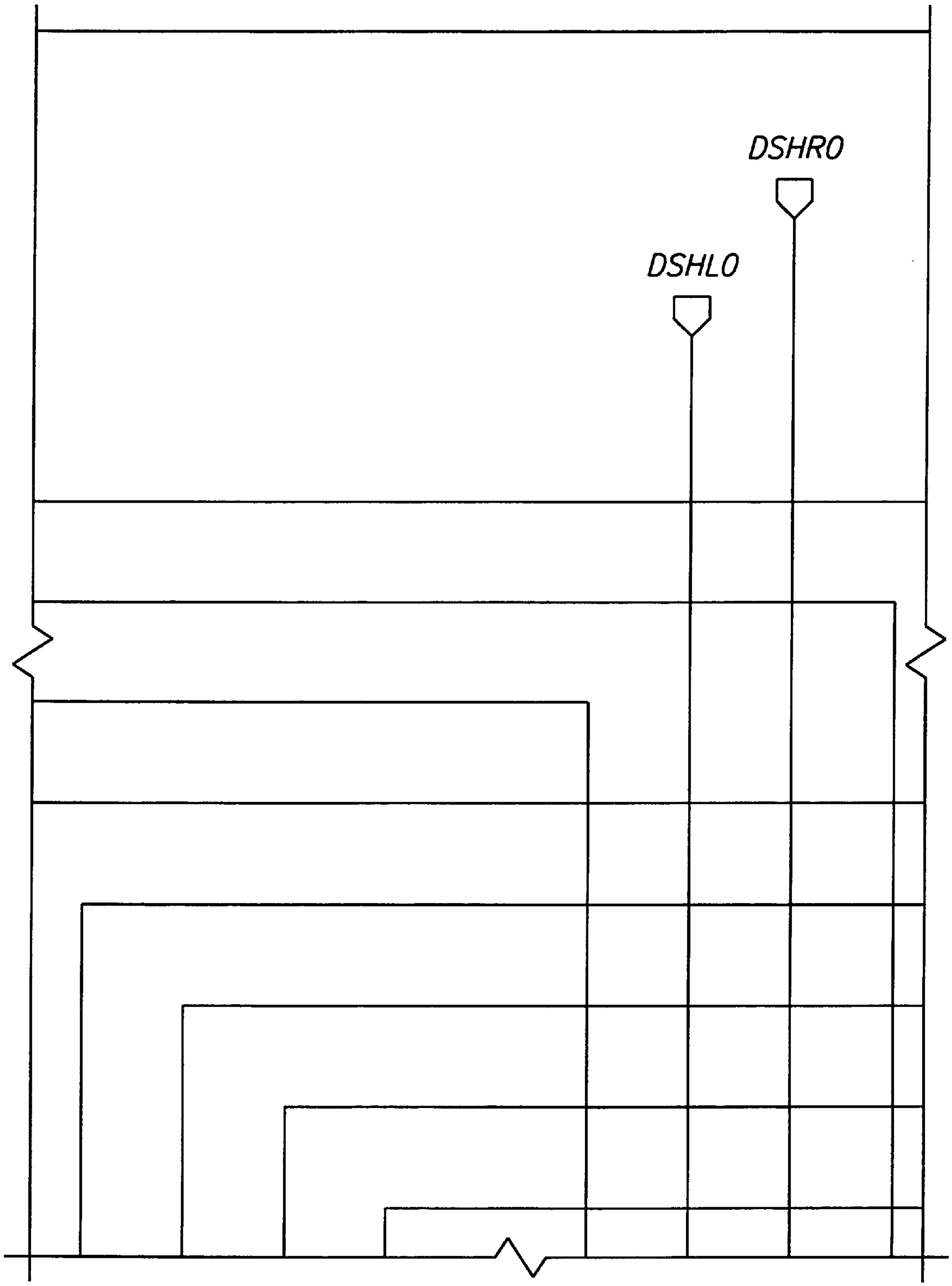
Fig 1.06AH

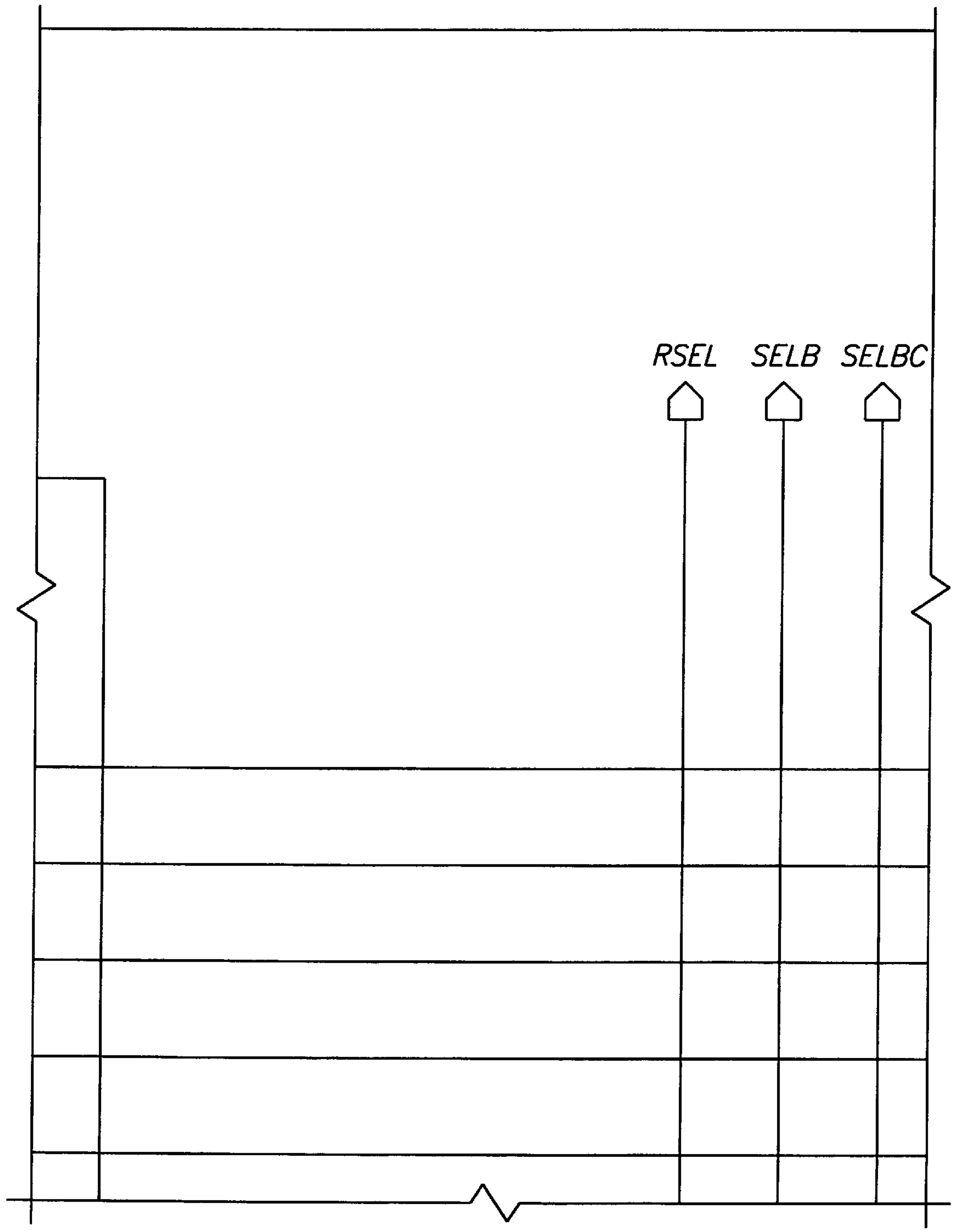
Fig 7.06AI

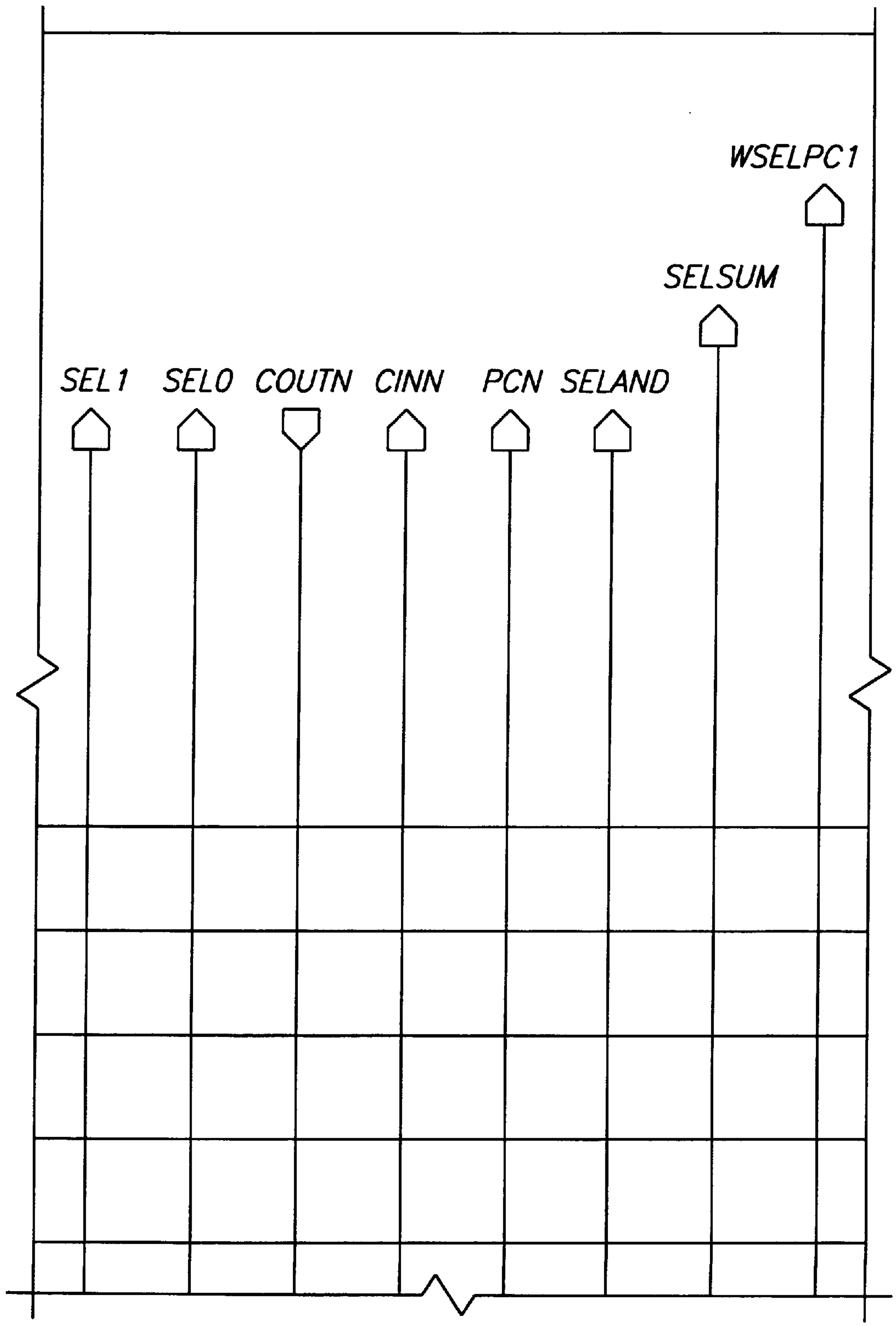
Fig 1.06A1

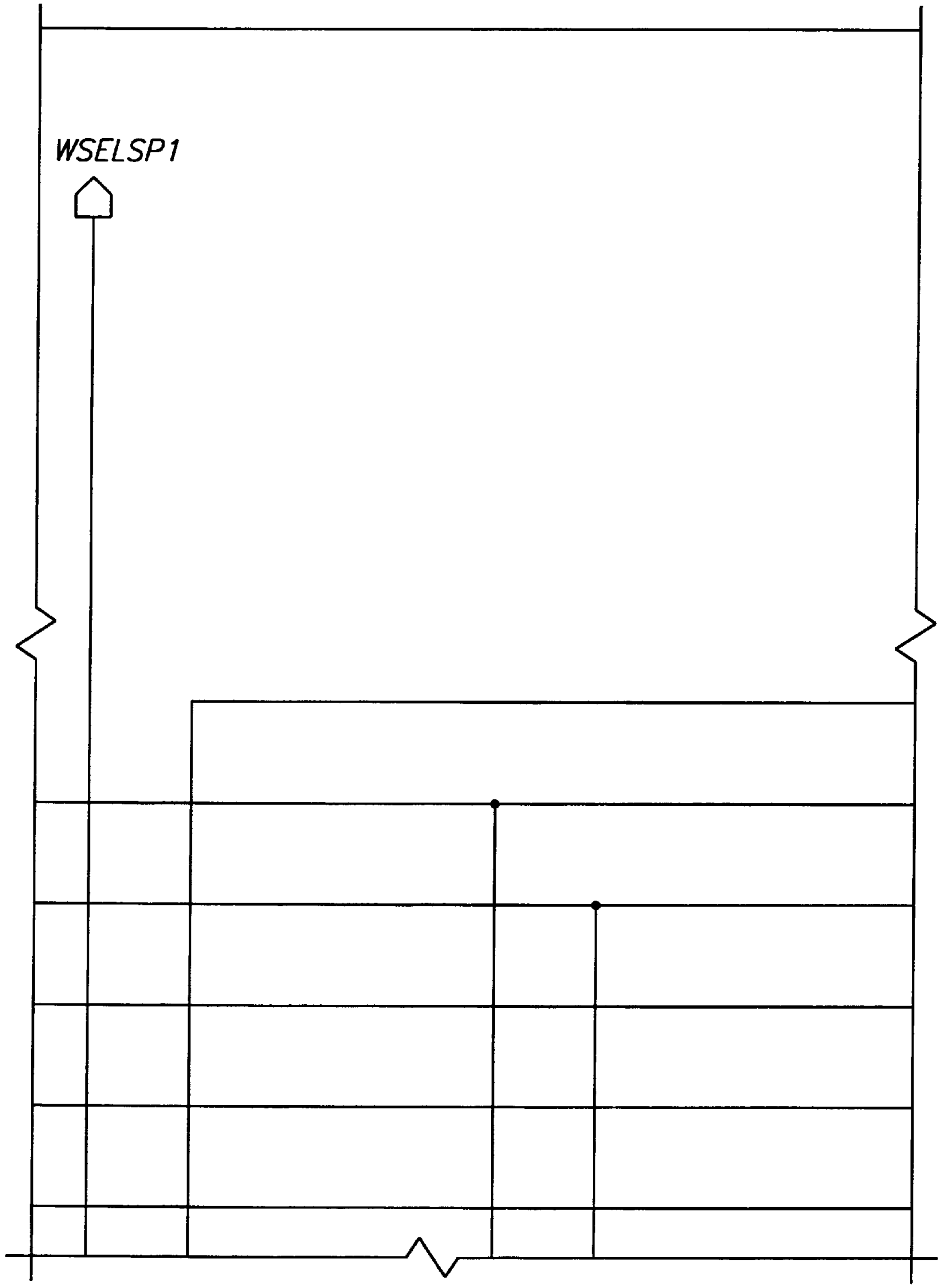
Fig 7.06AK

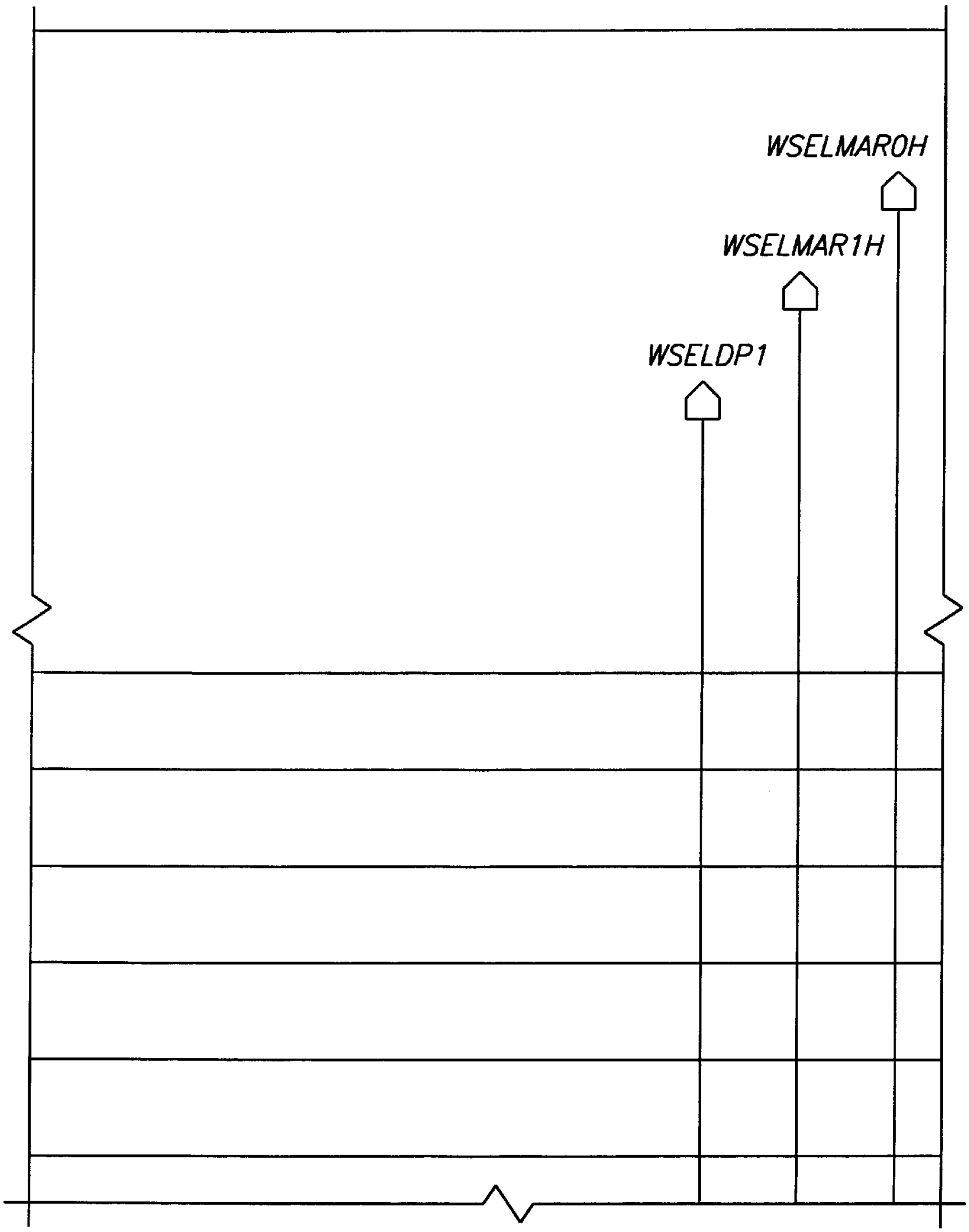
Fig 7.06AL

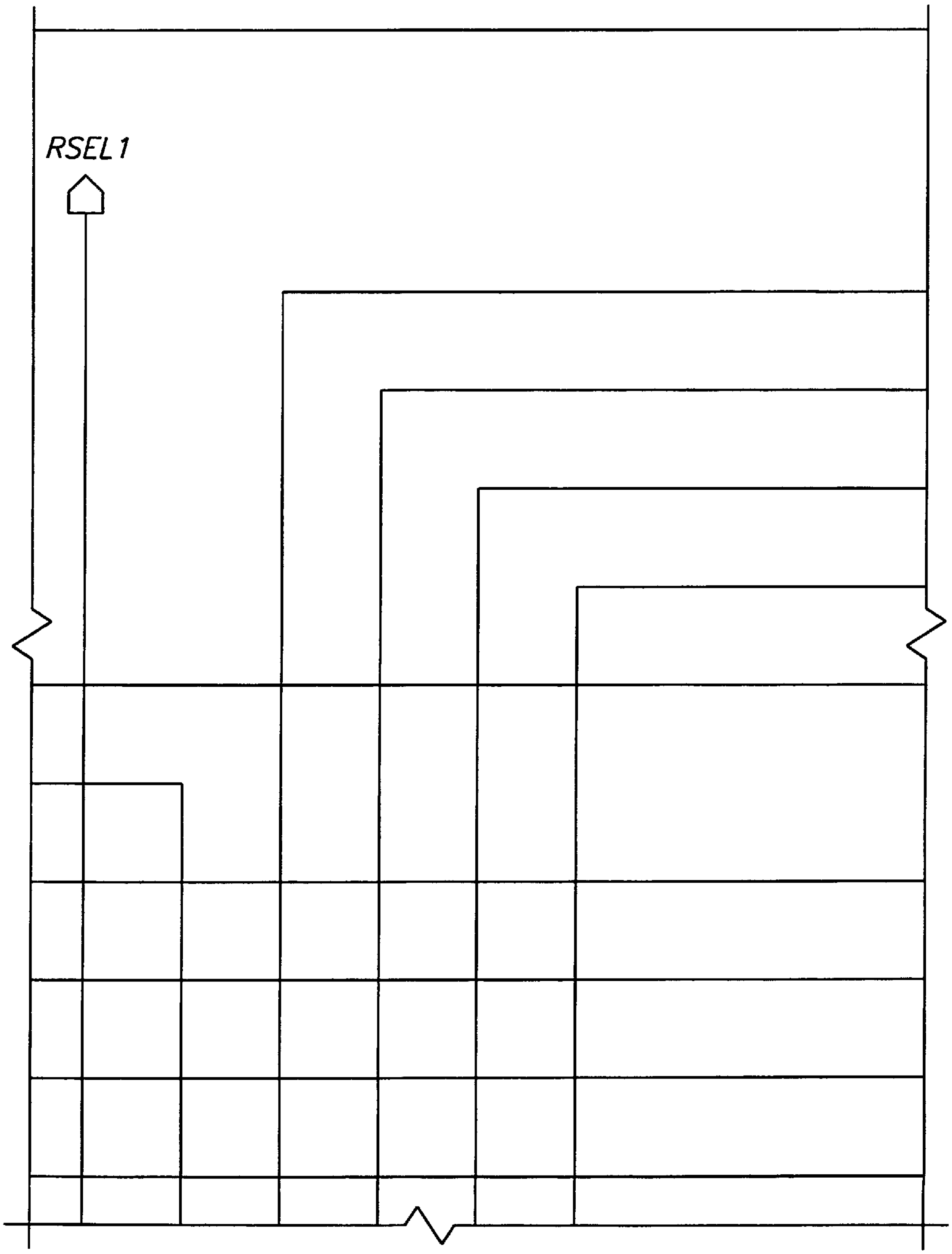
Fig 7.06AM

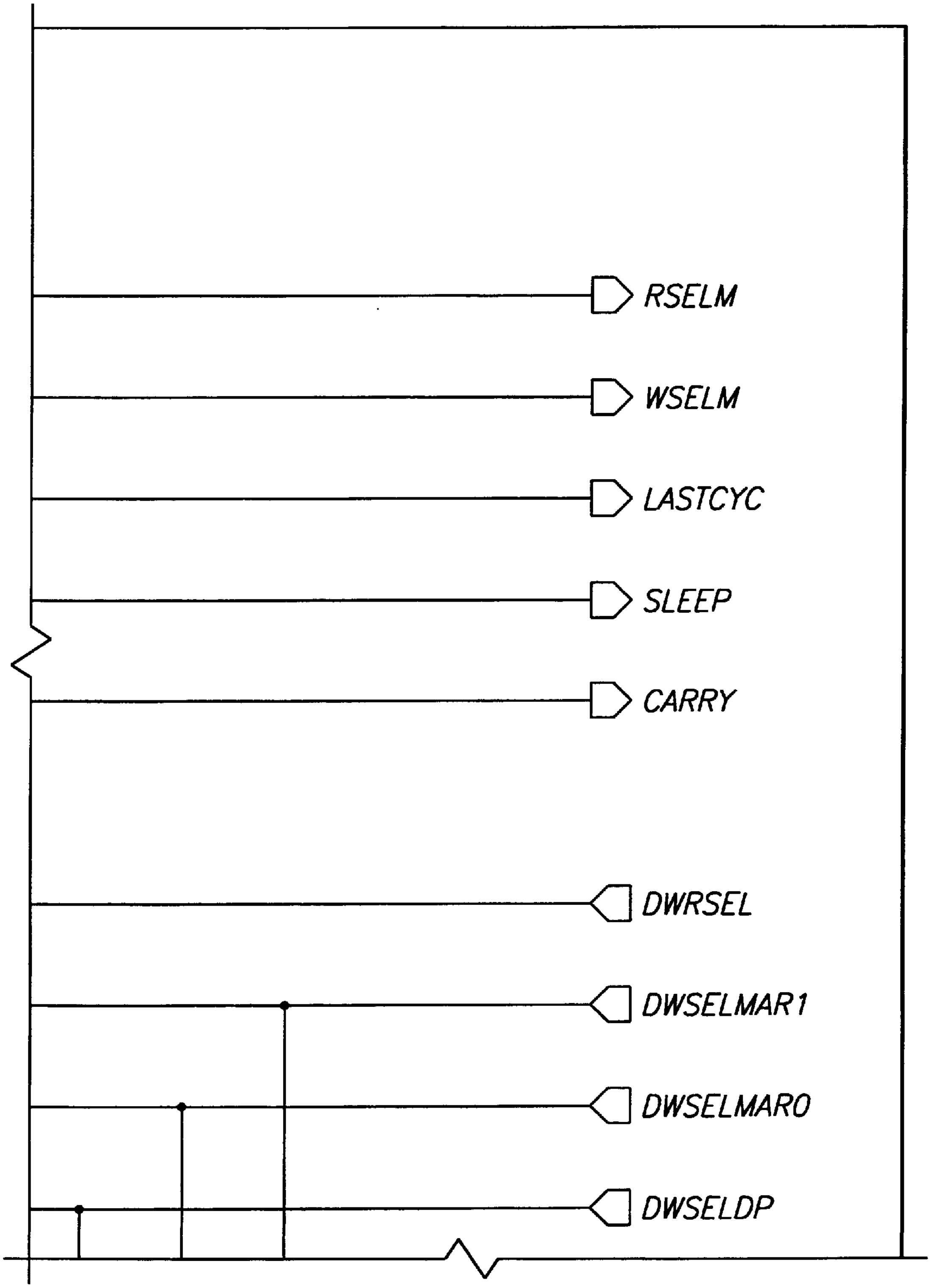
Fig 7.06AN

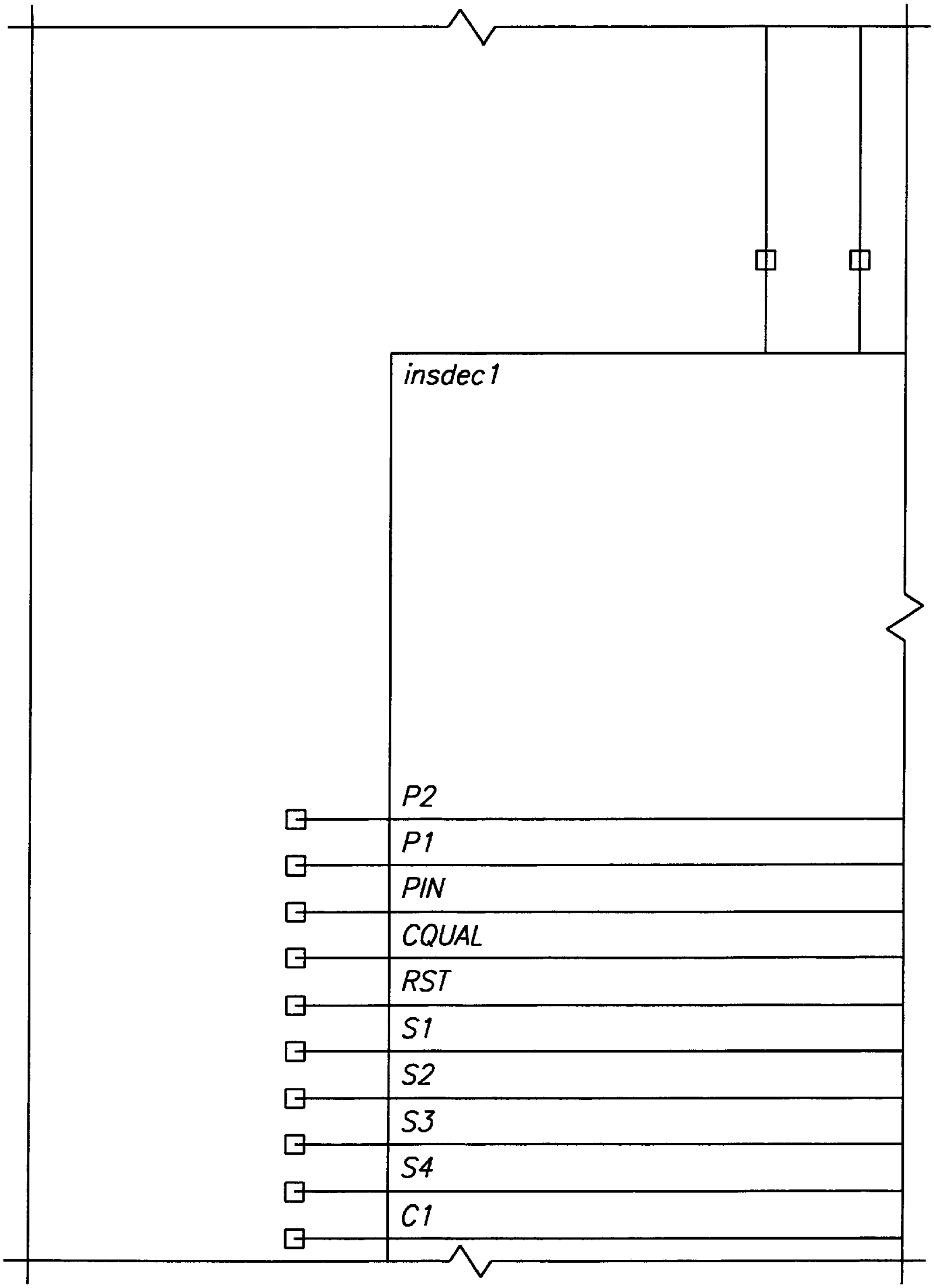
Fig 1.06BB

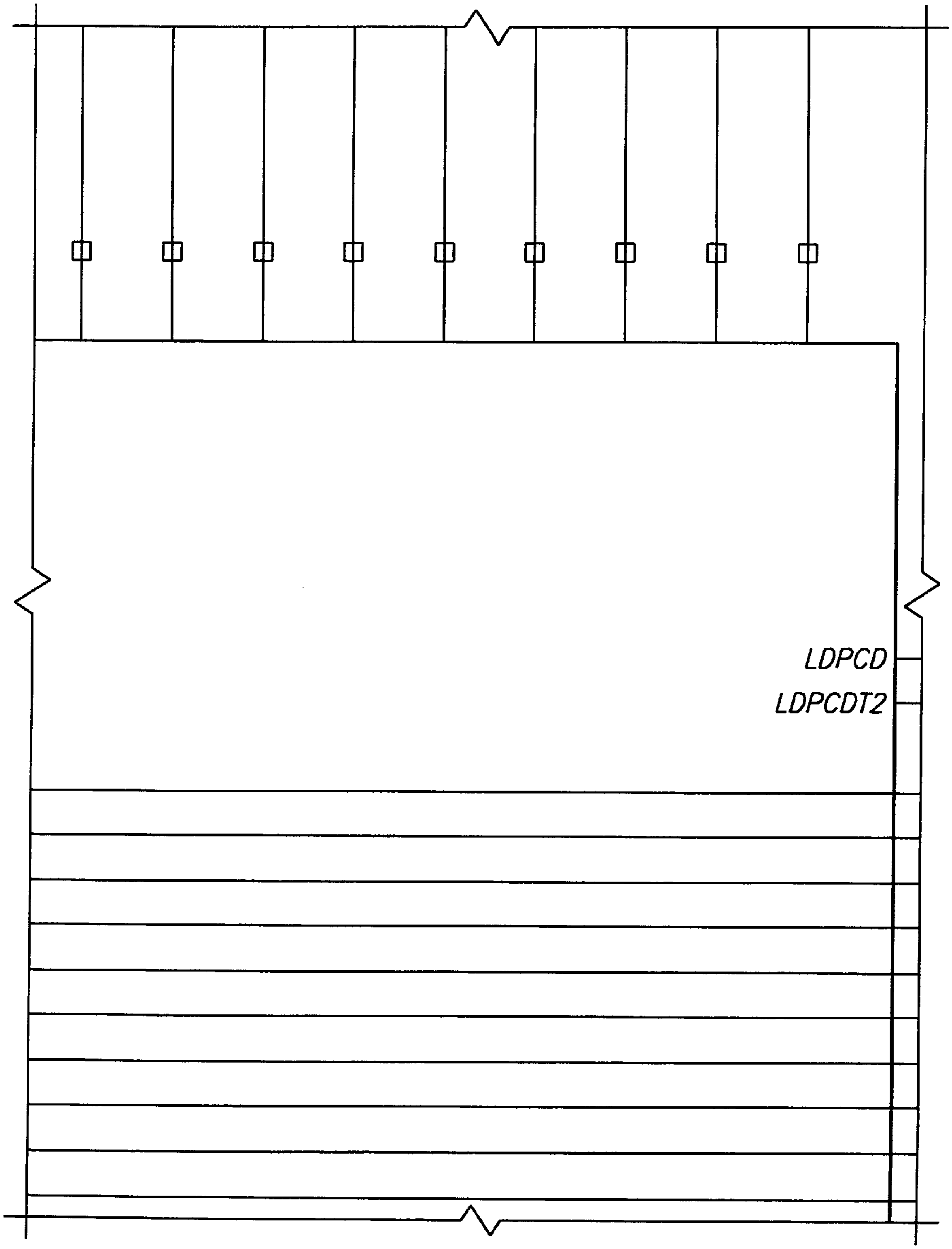
Fig 7.06BC

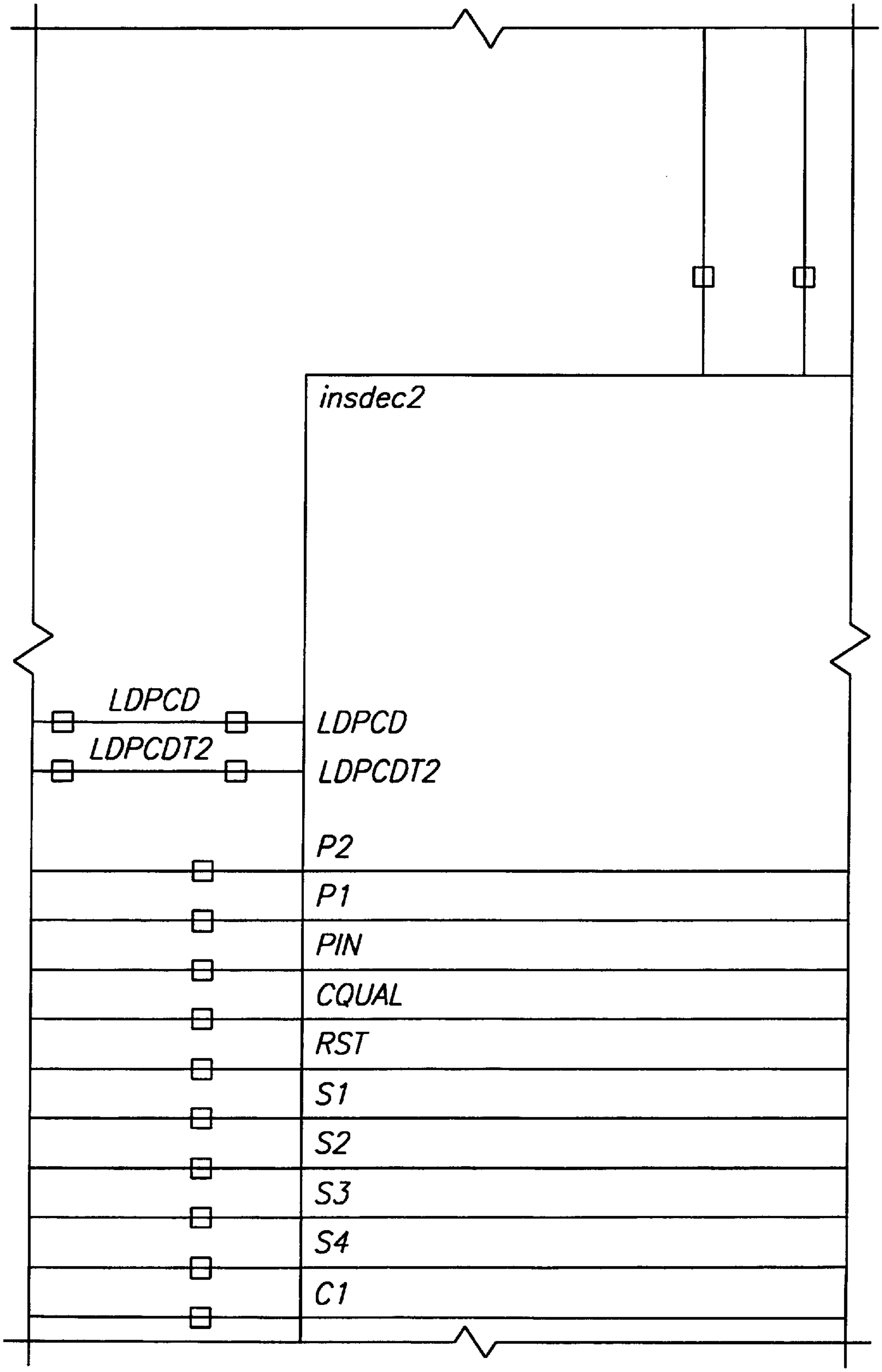
Fig 7.06BD

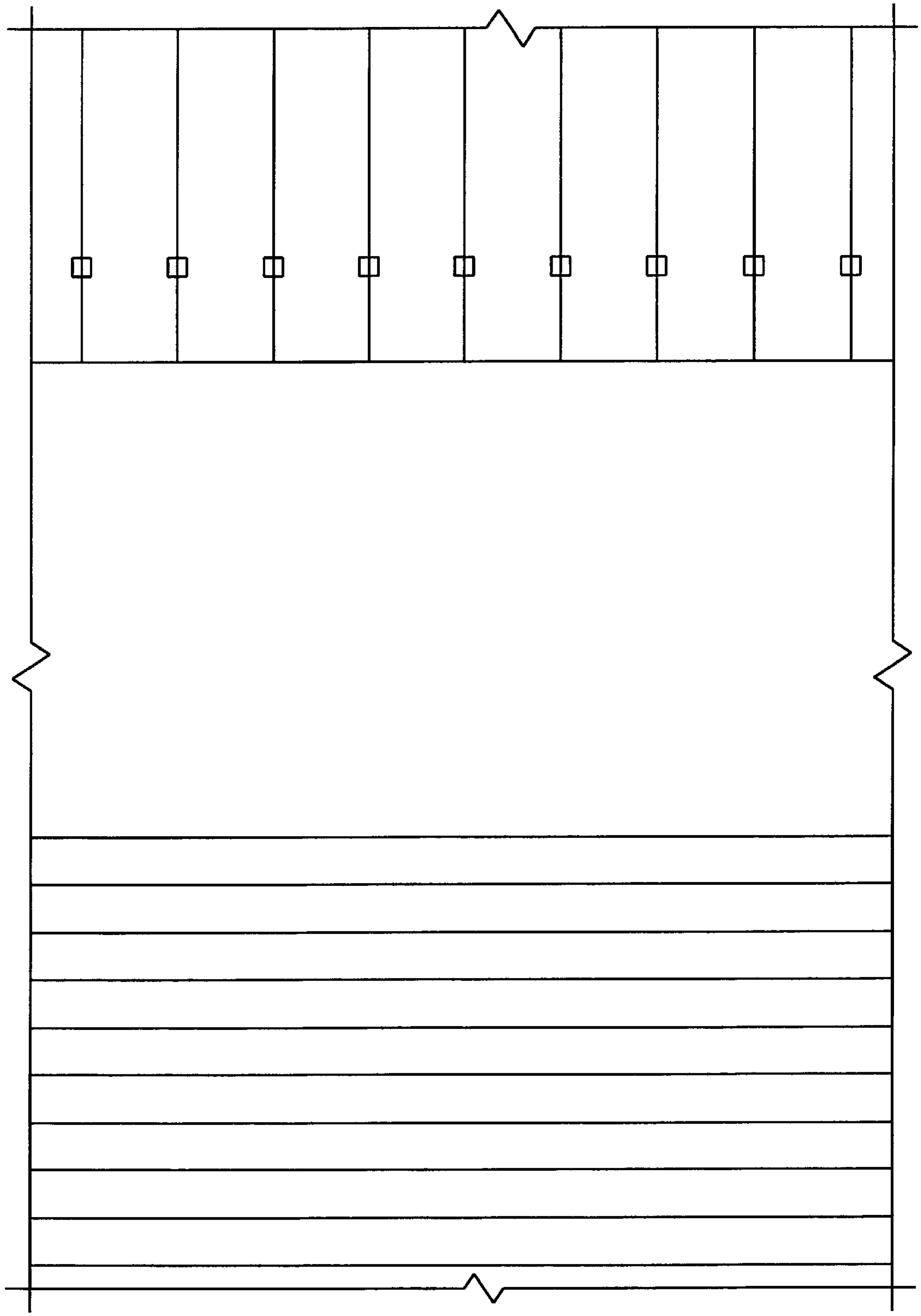
Fig 1.06BE

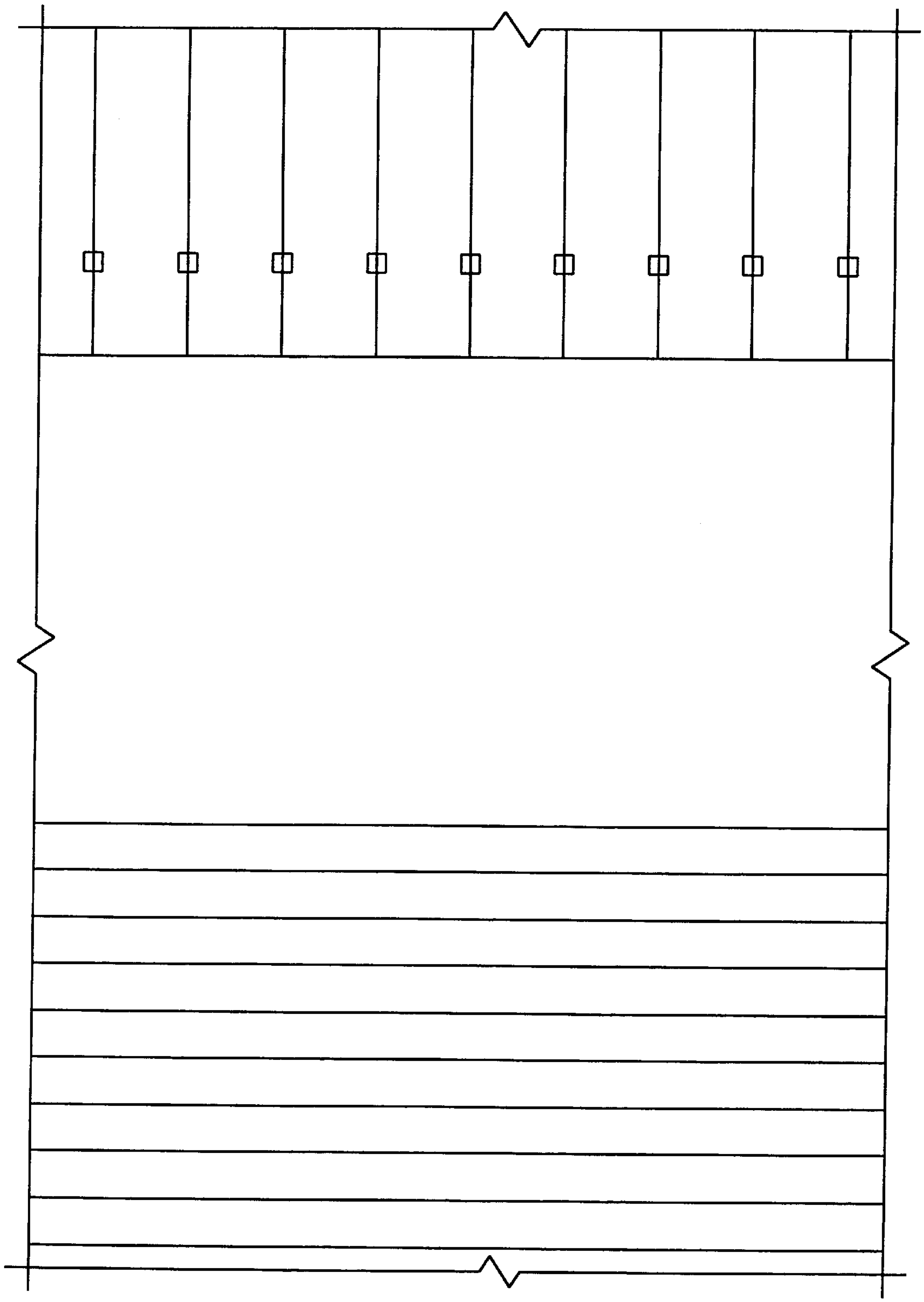
Fig 1.06BF

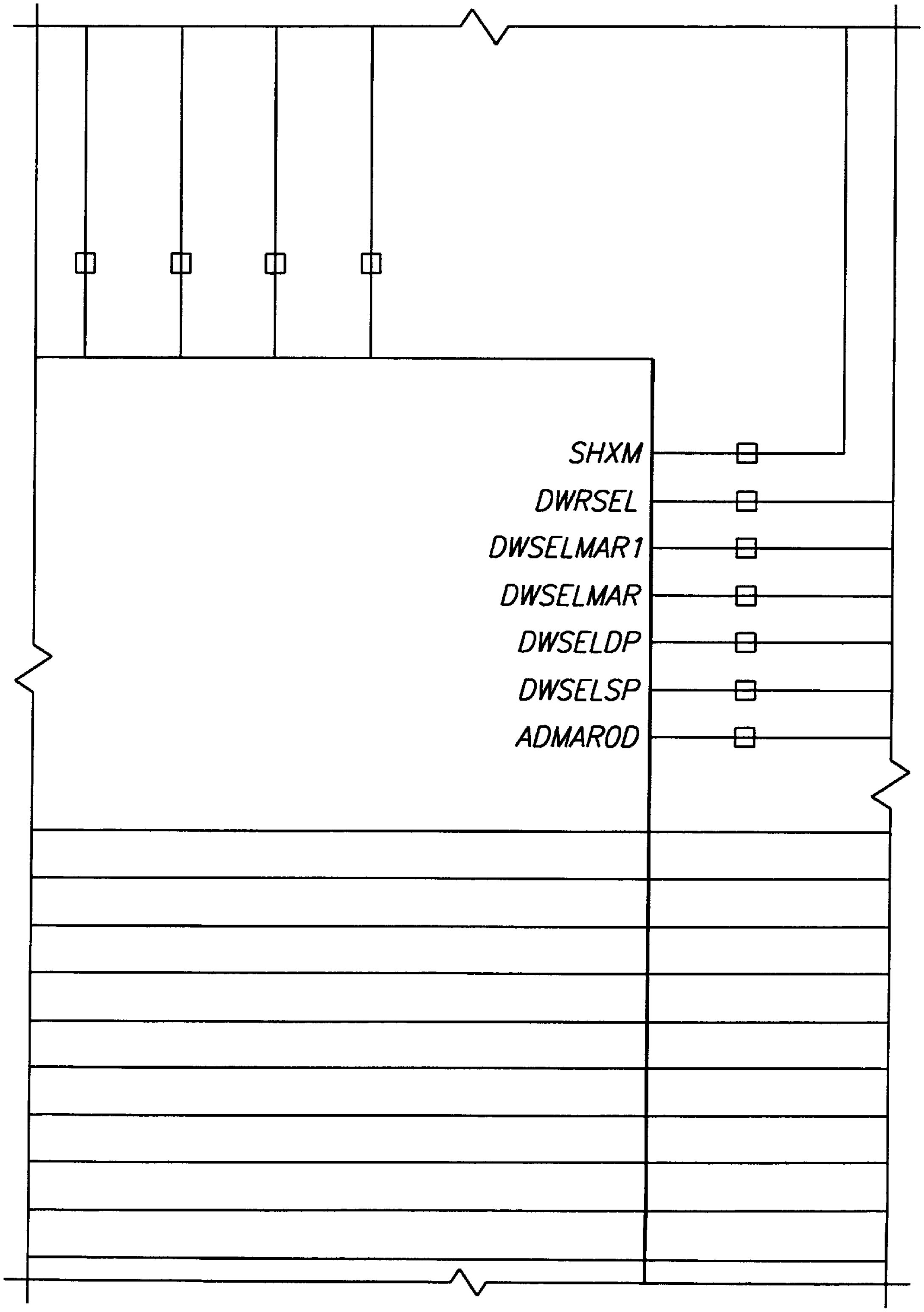
FIG 7.06BG

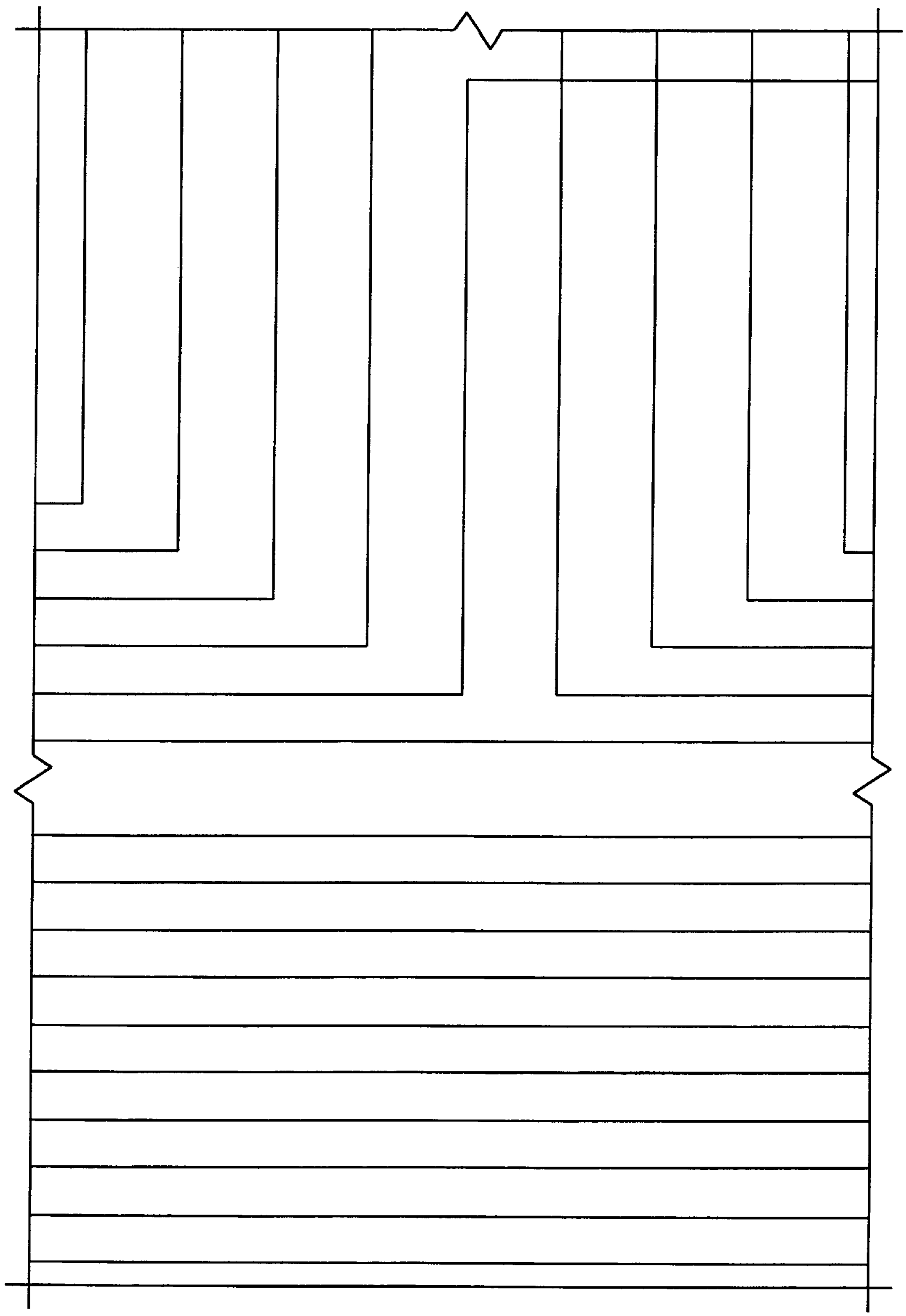
Fig 7.06BH

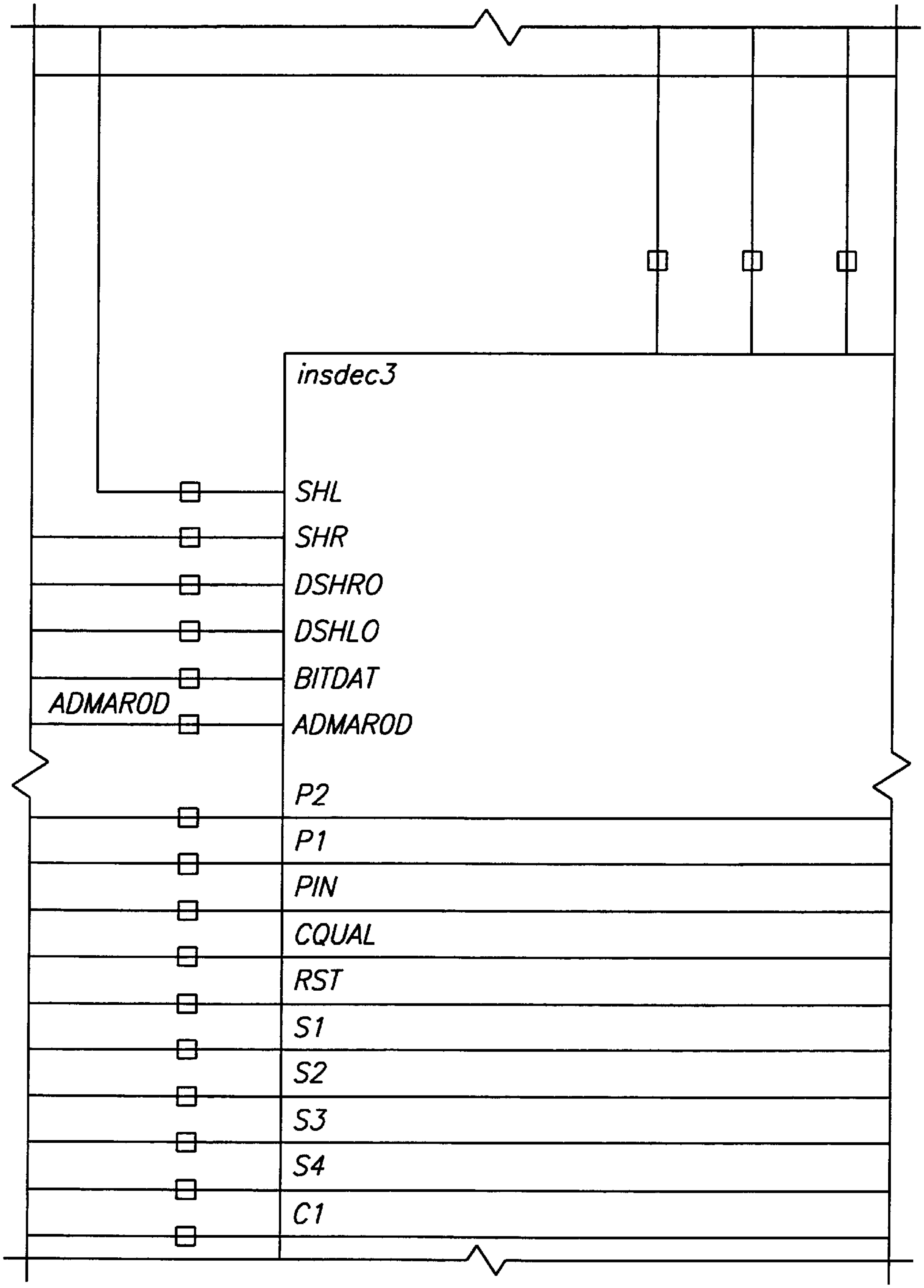
FIG 7.06BI

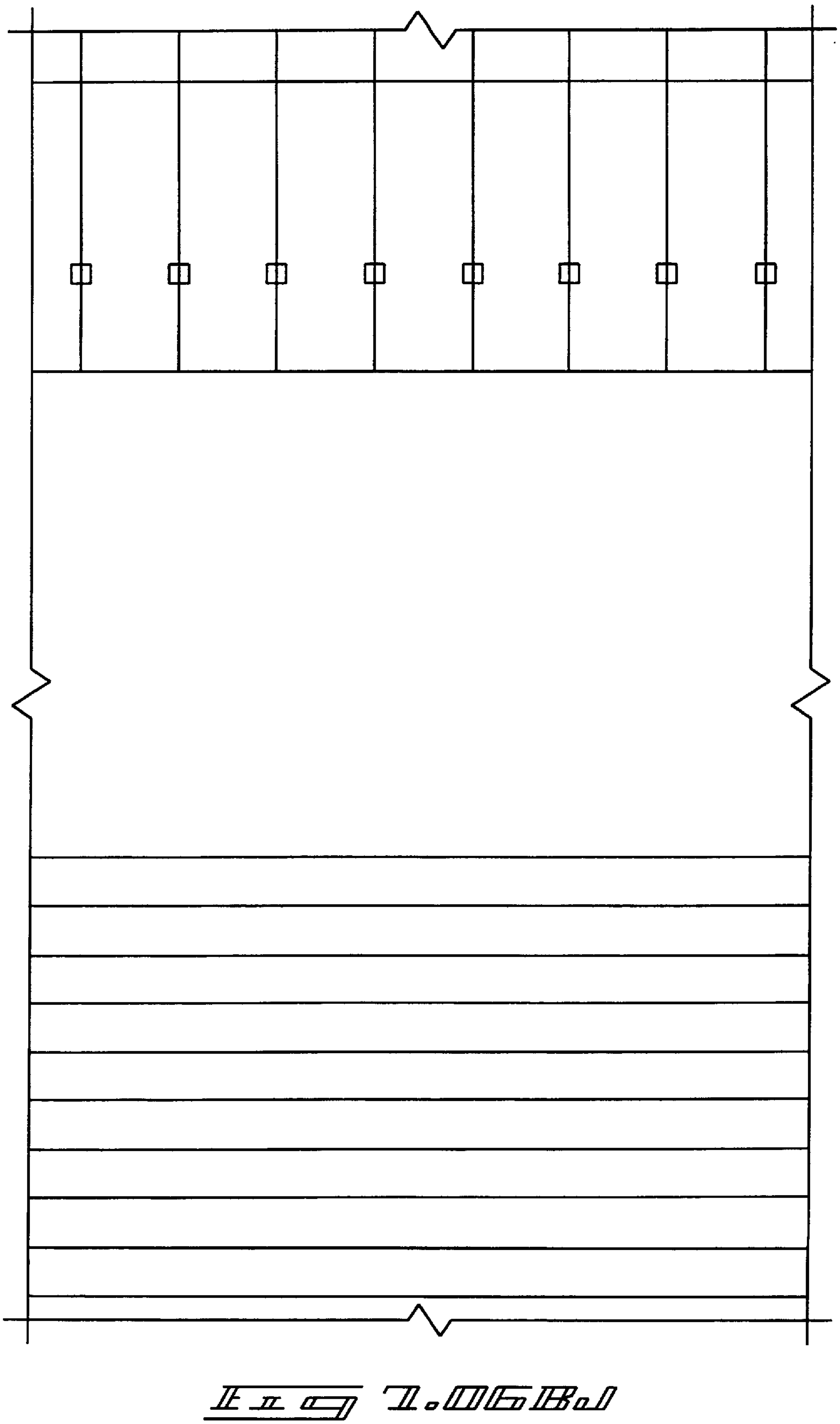
Fig 1.06BJ

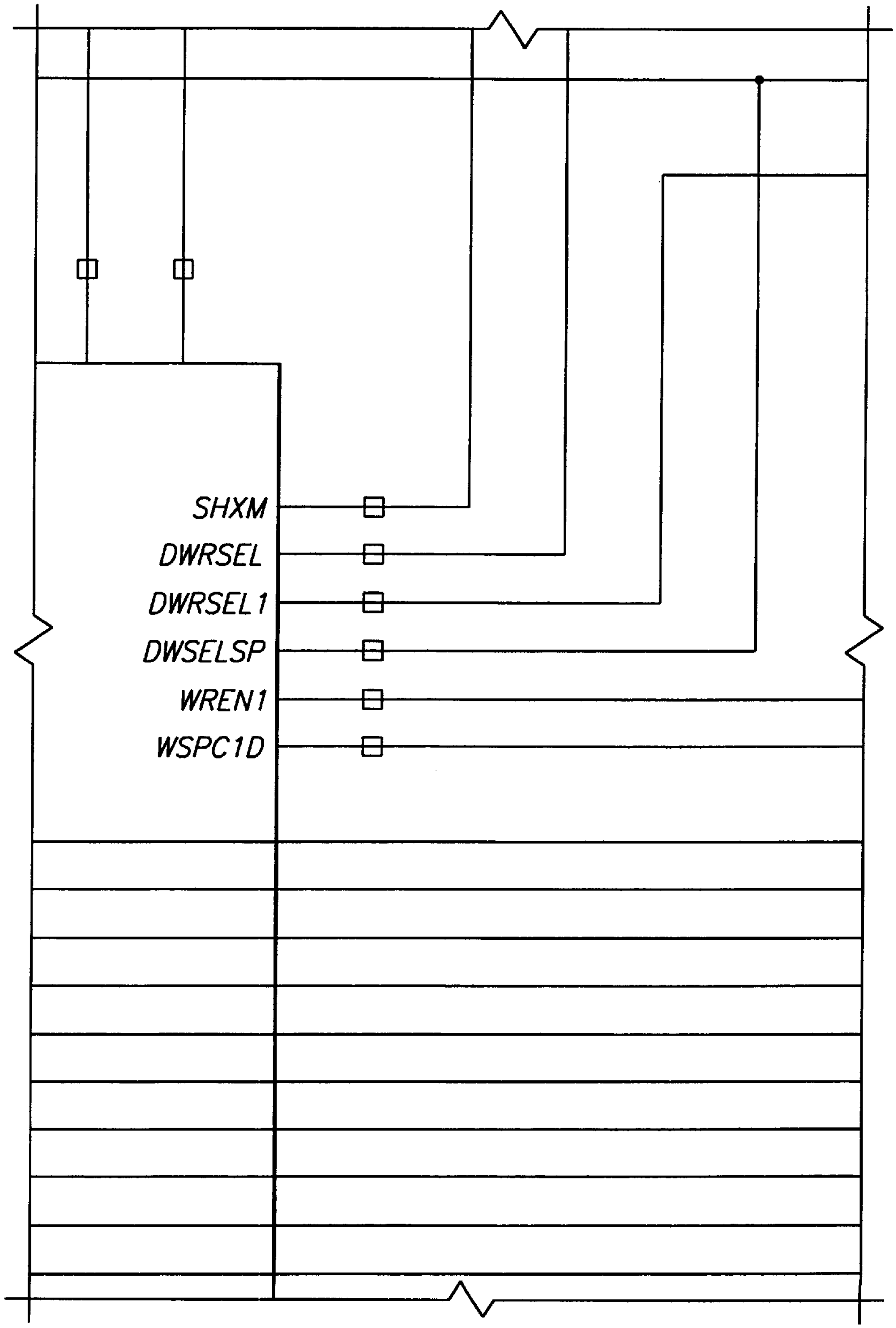
Fig 7.06BK

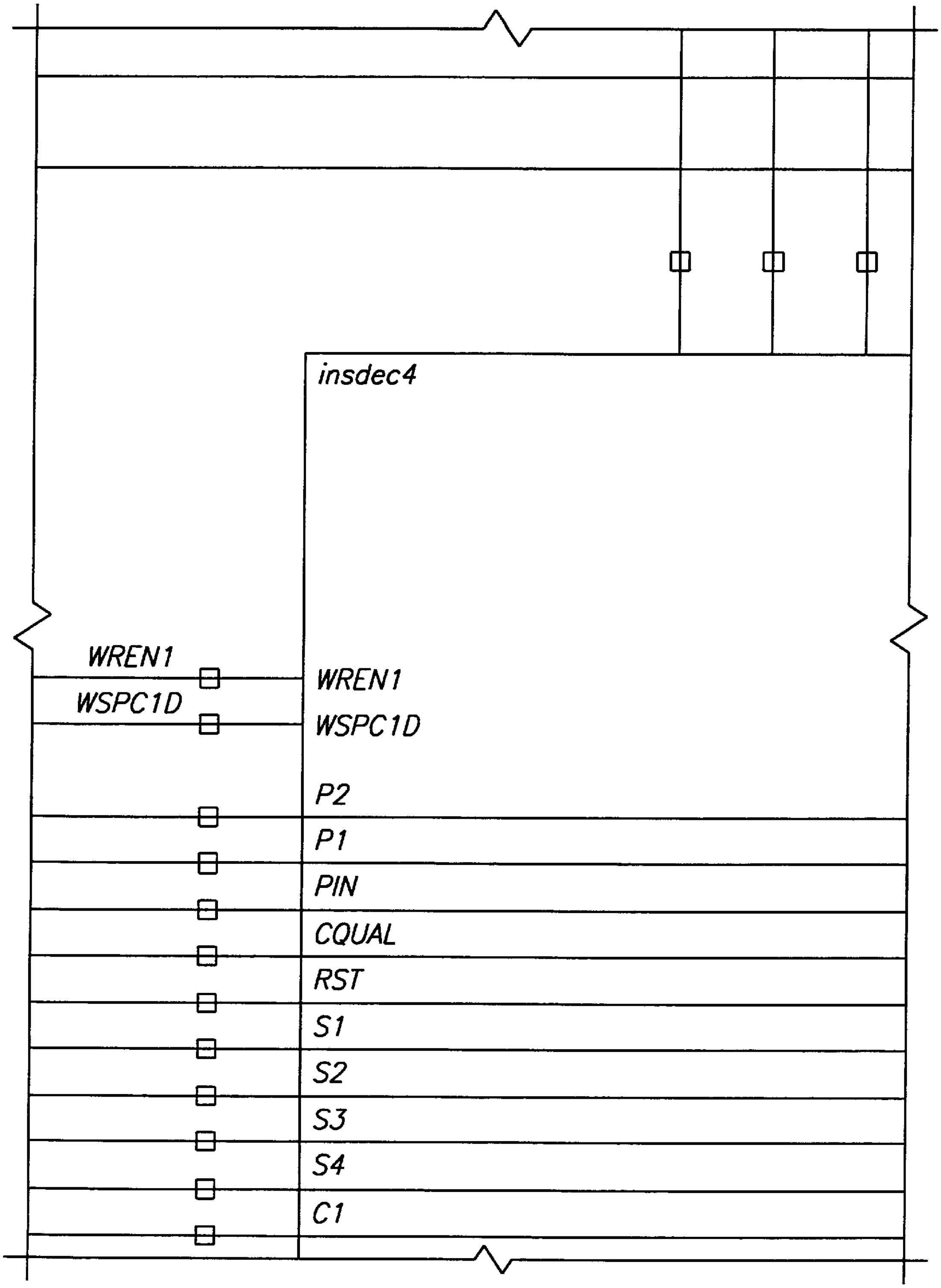
Fig 7.06BL

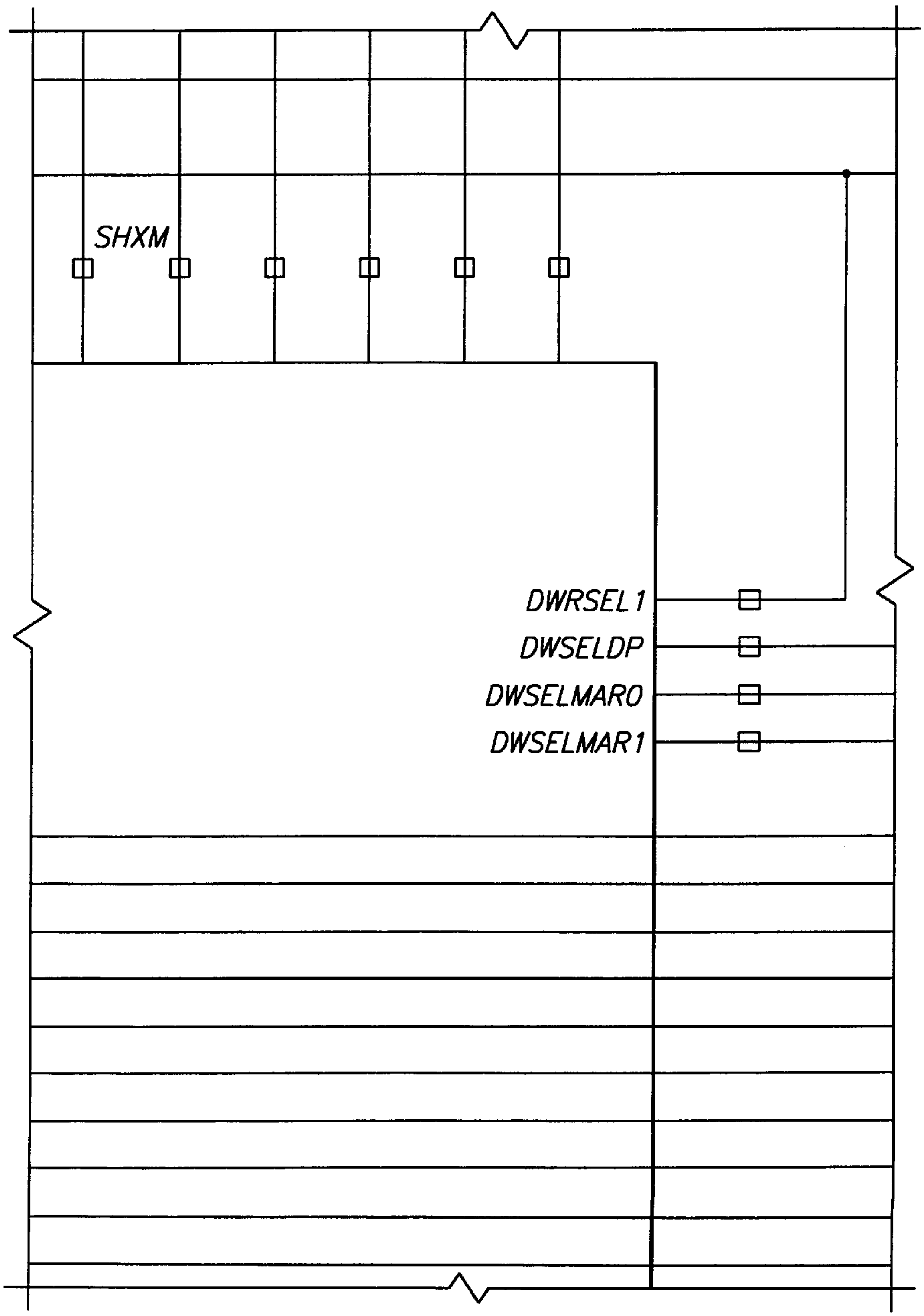
FIG 7.06BM

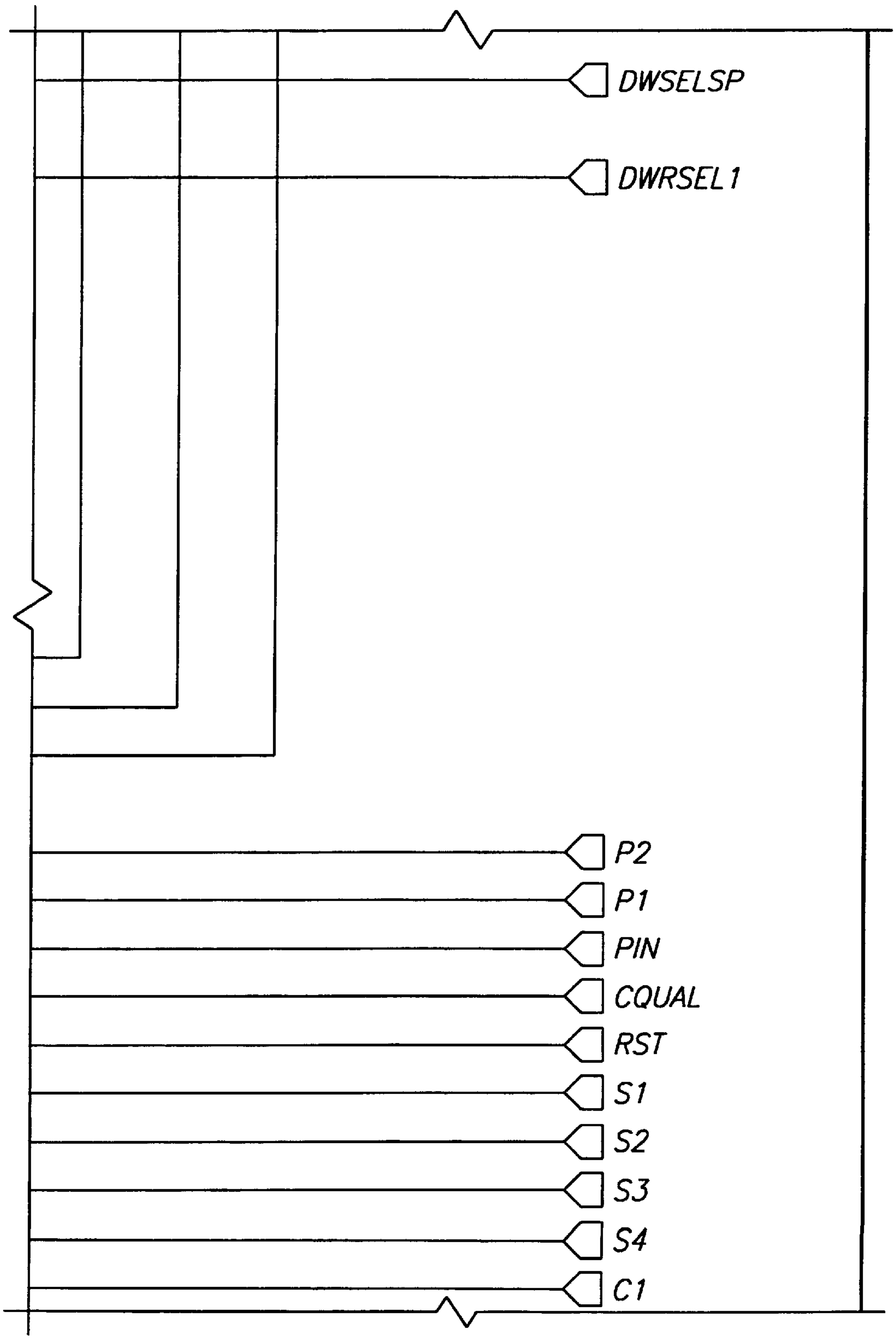
Fig 7.06BN

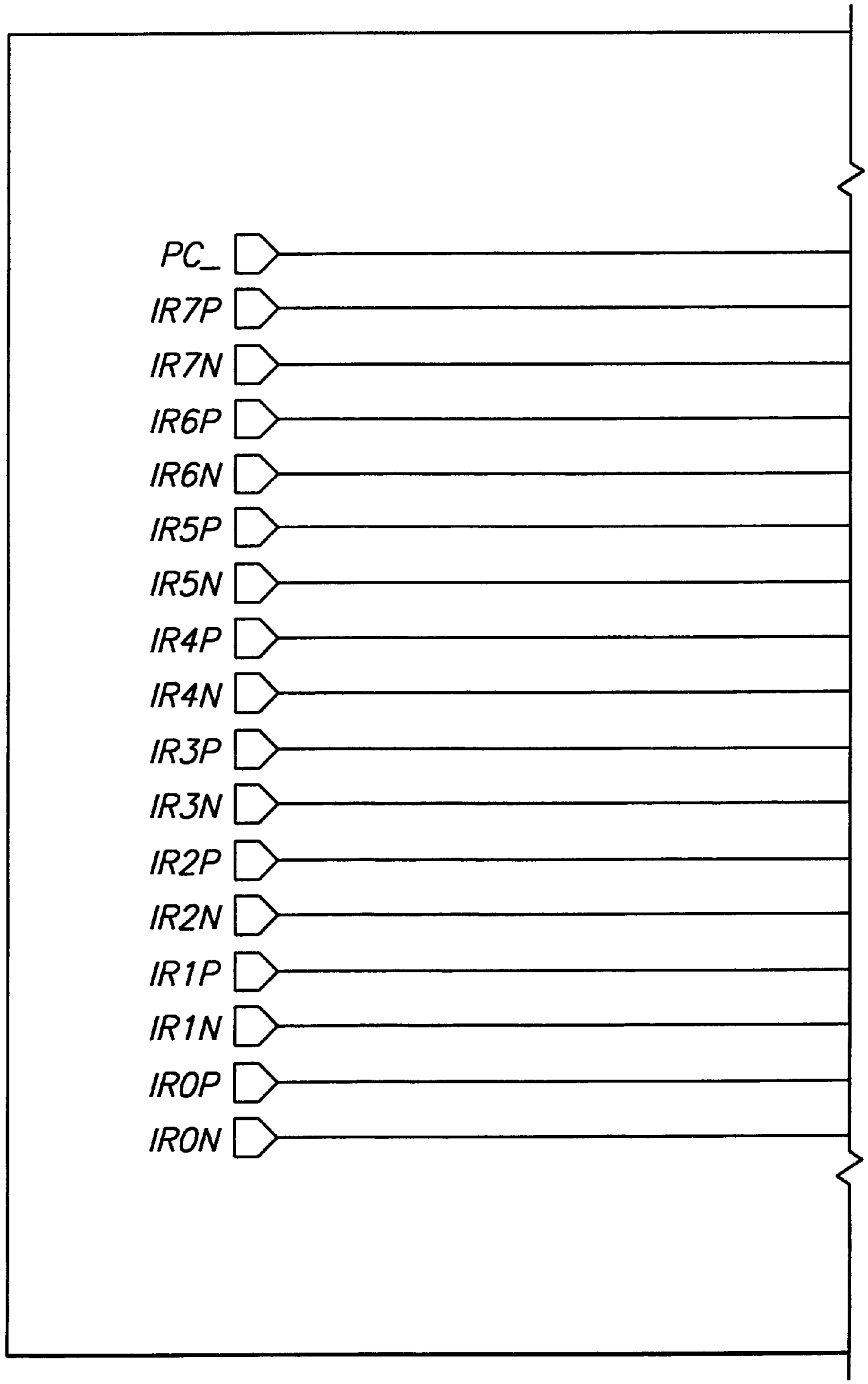
Fig 7.06CA

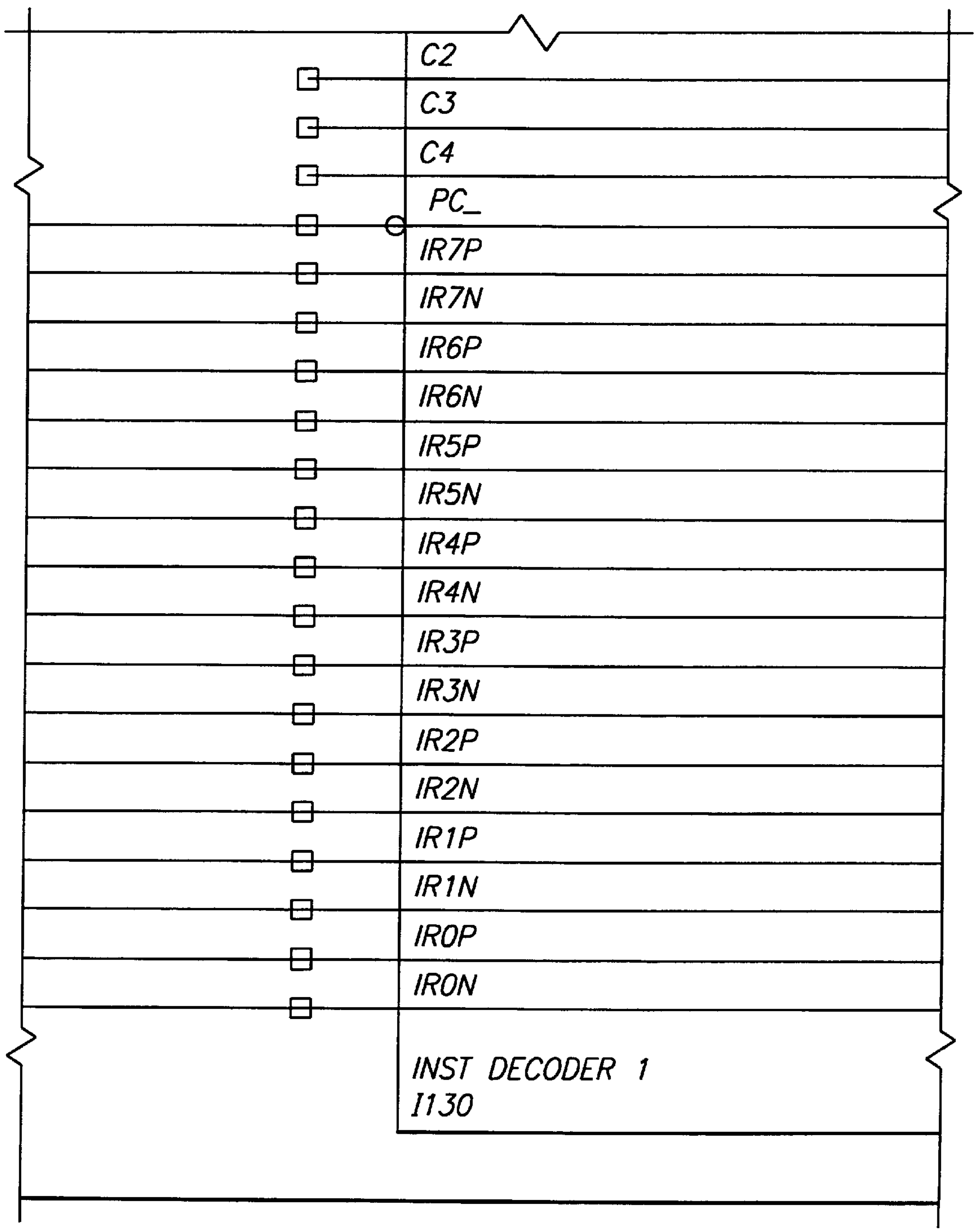
Fig 7.06CB

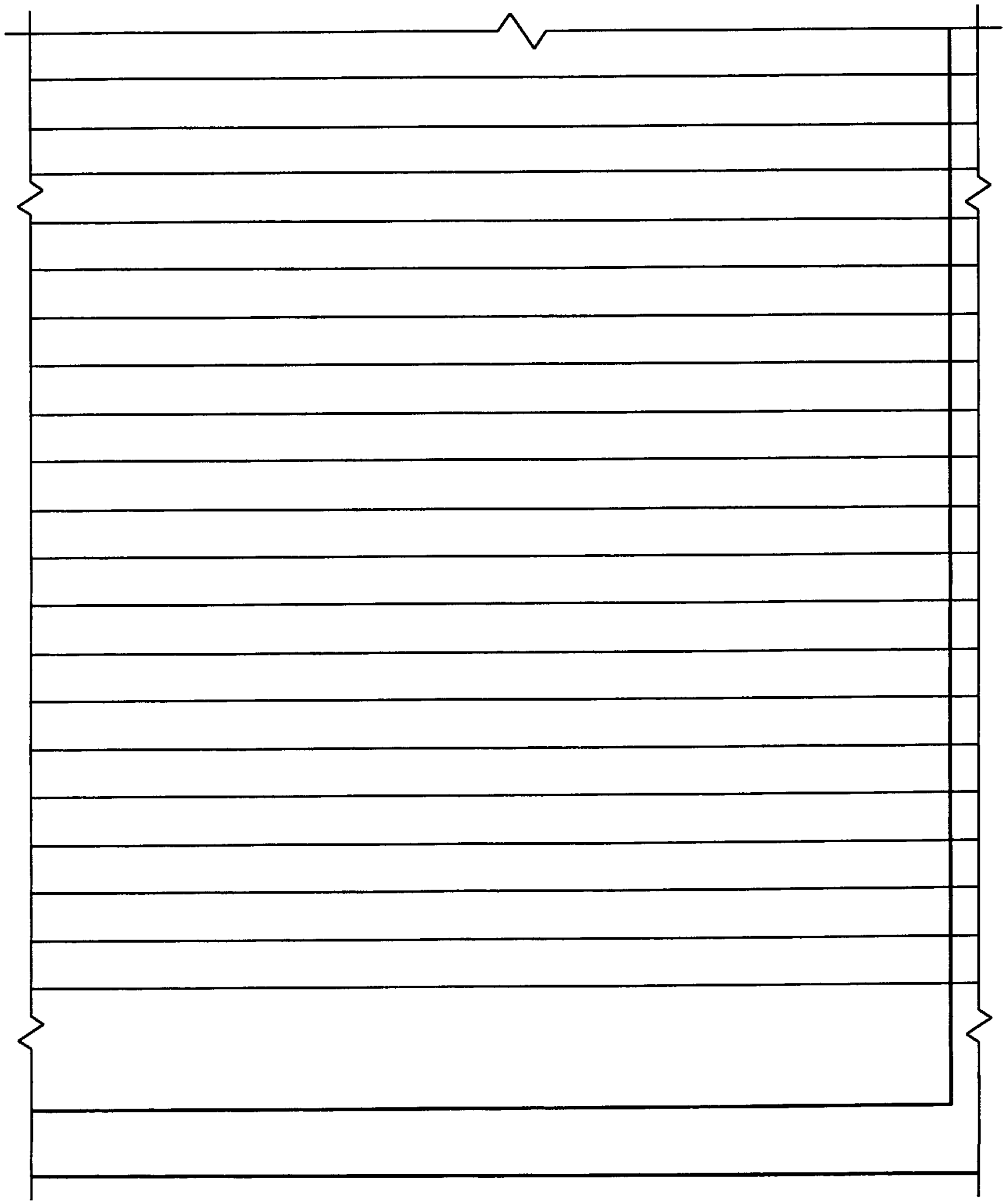
Fig 7.06CC

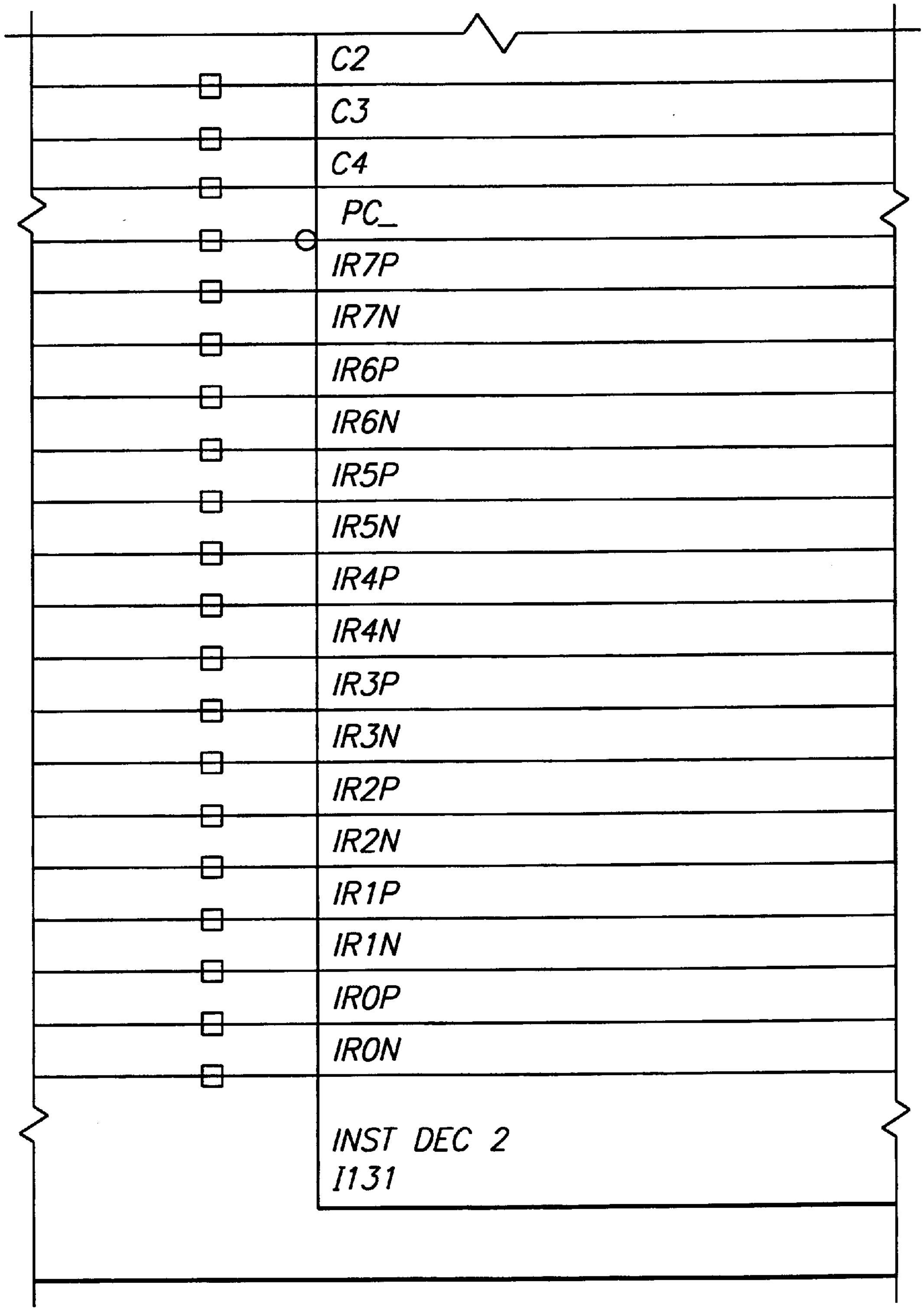
Fig 7.06CD

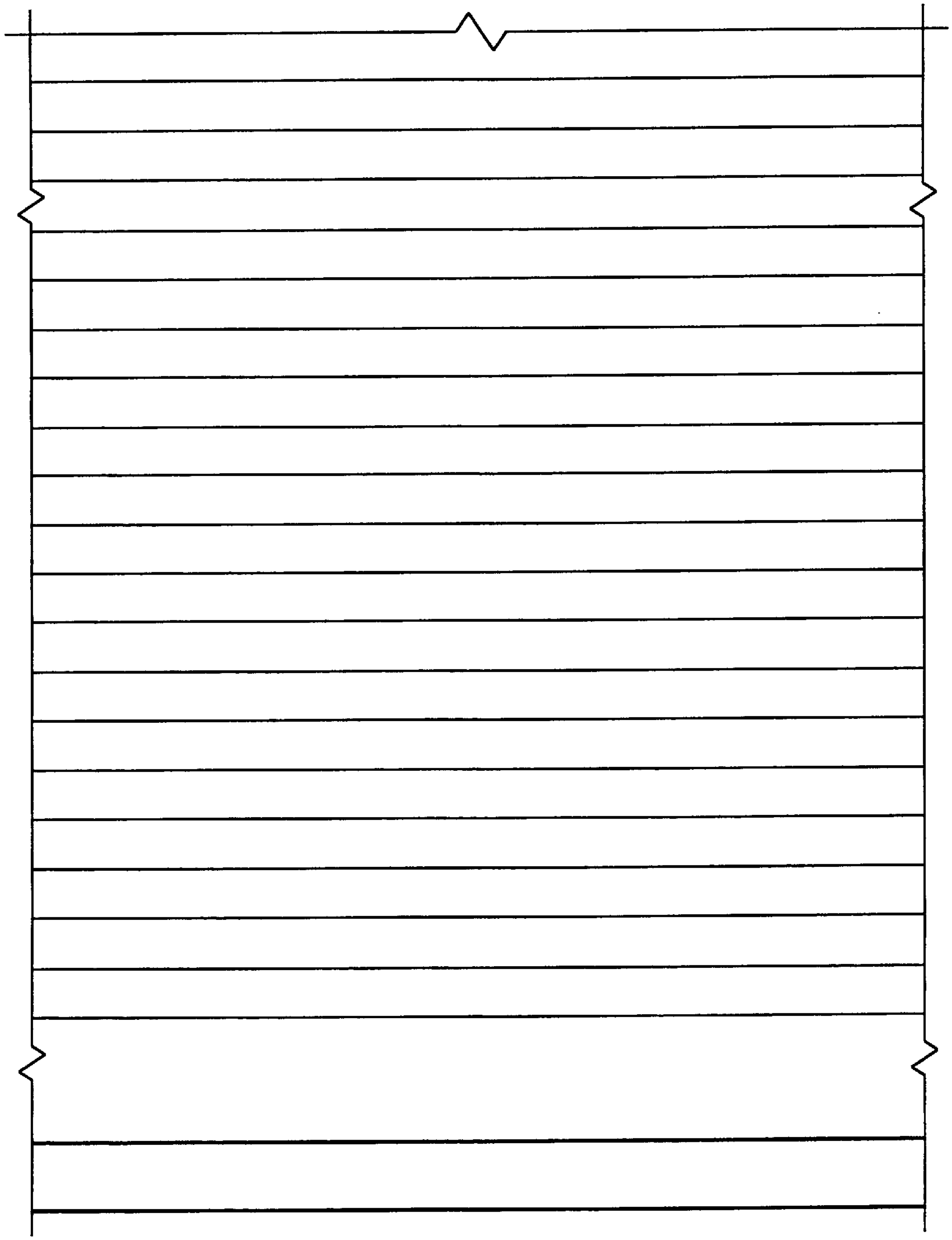
Fig 7.06CE

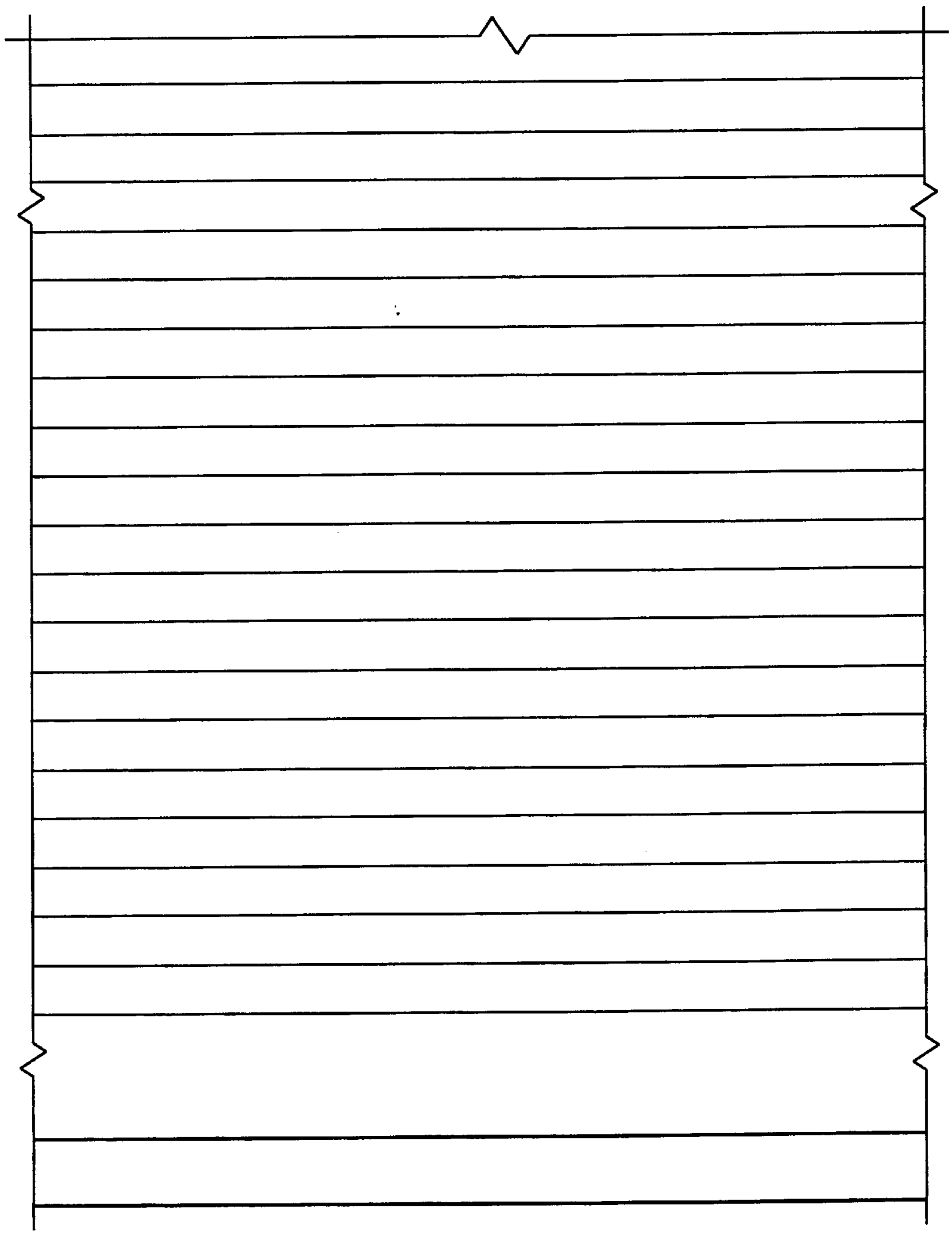
Fig 7.06CF

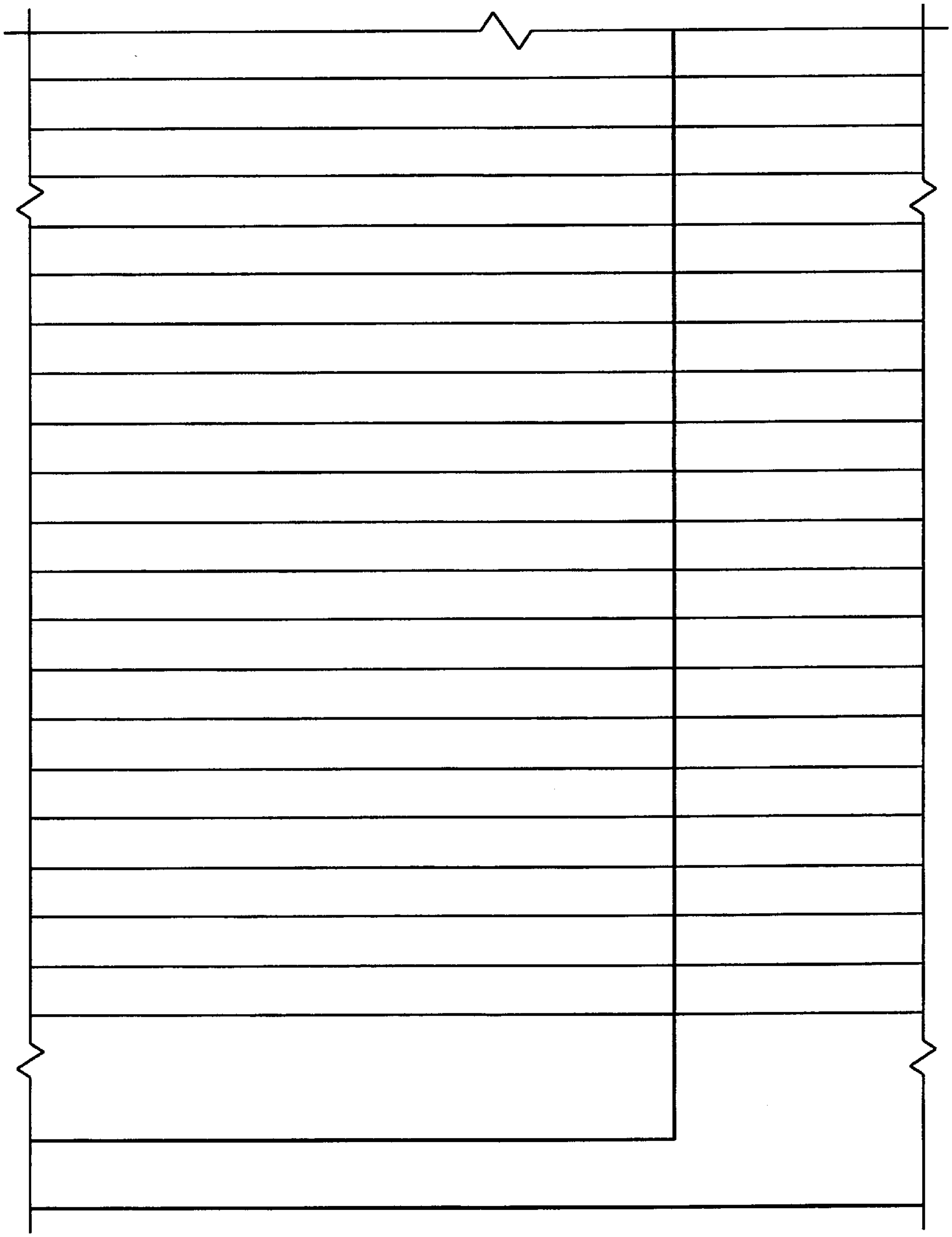
Fig 7.06CG

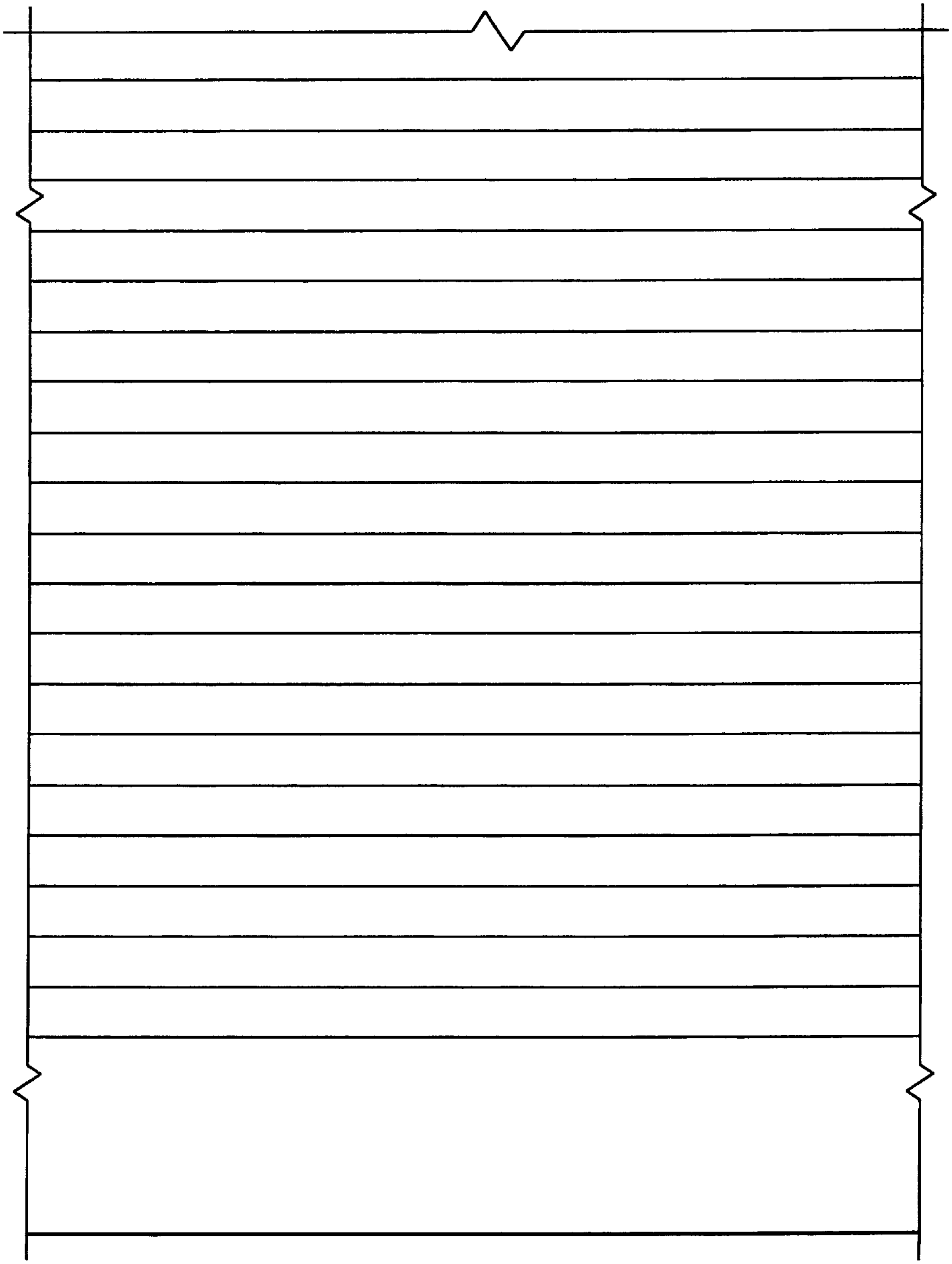
FIG 7.06CH

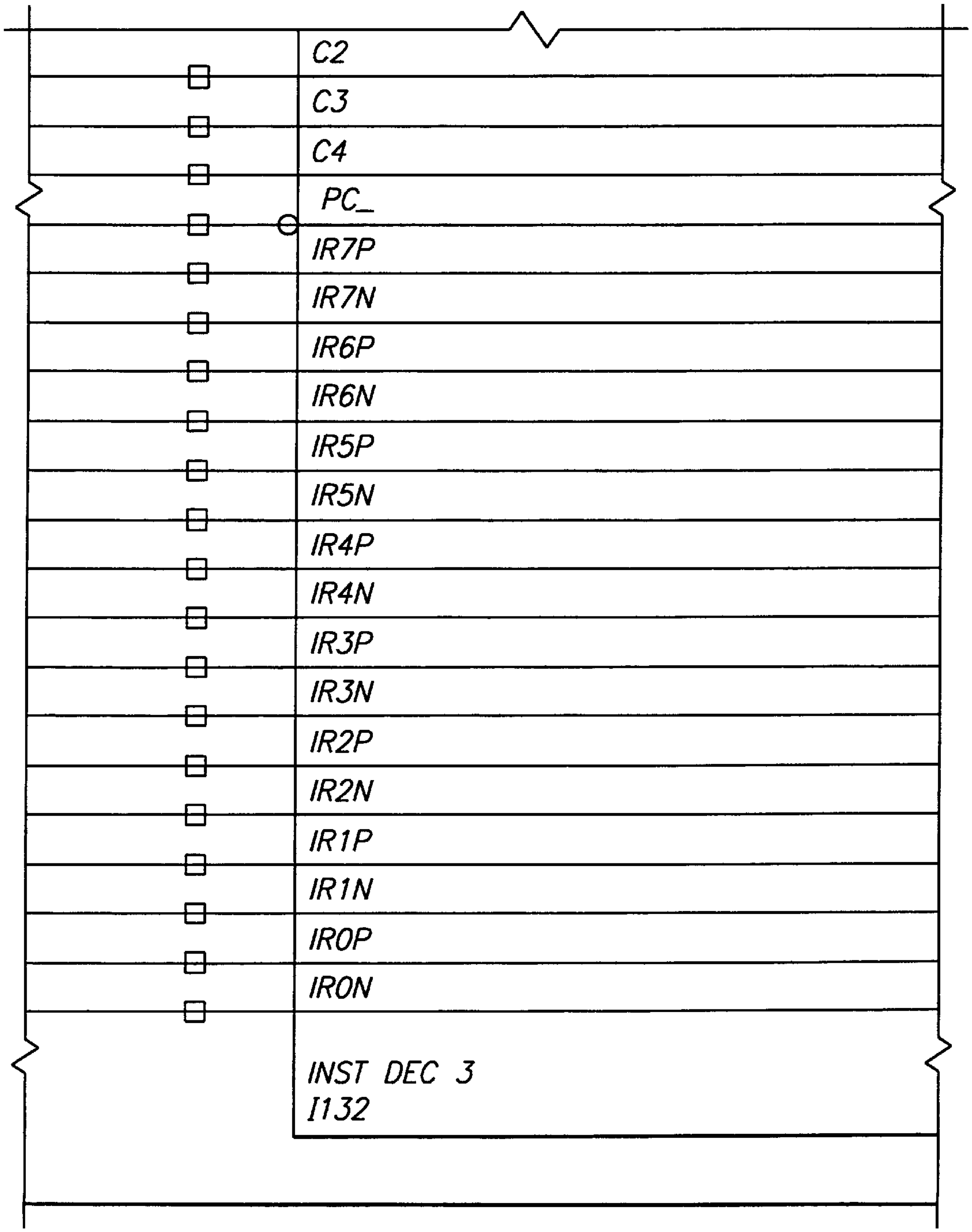
Fig 7.06CI

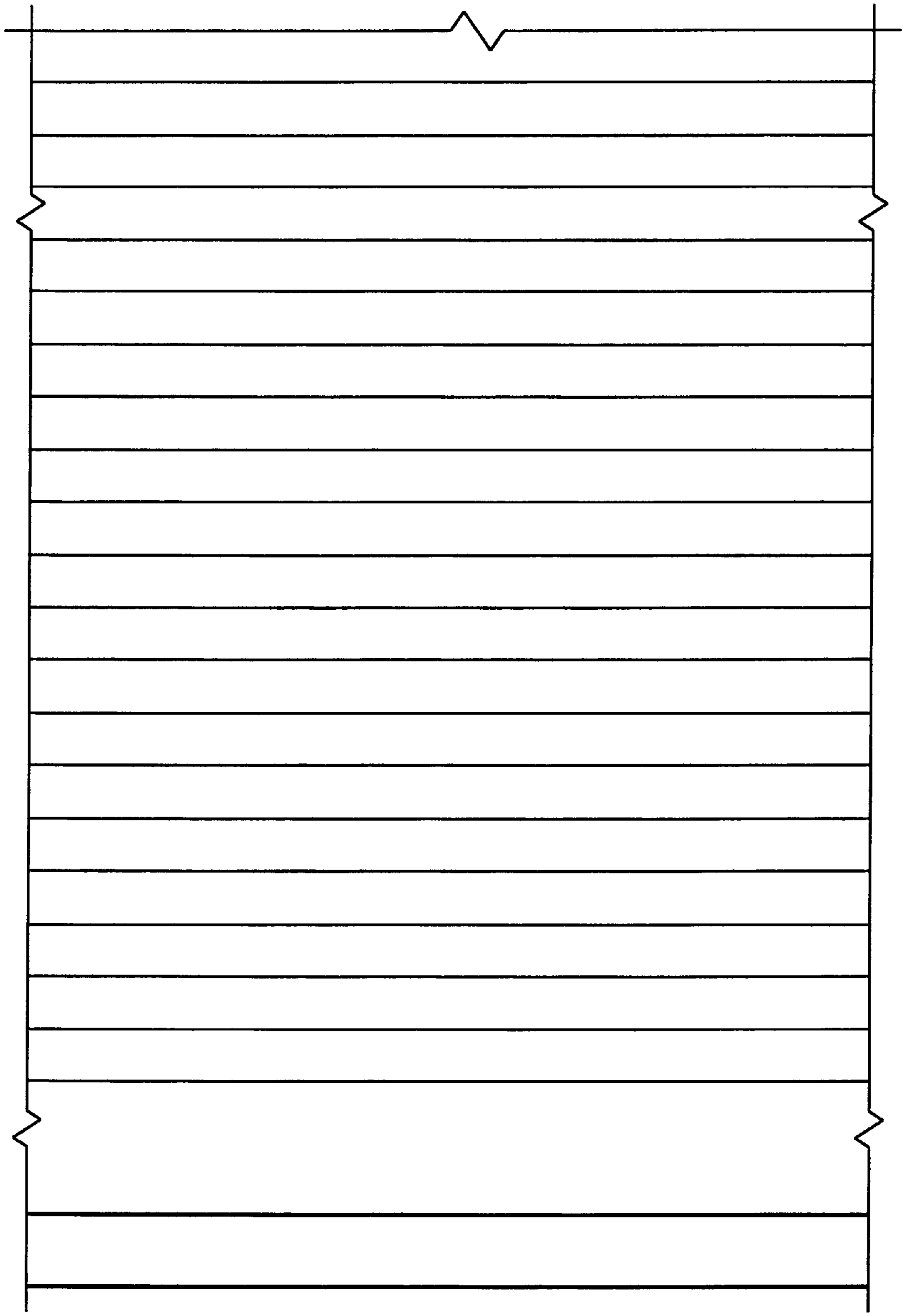
Fig. 7.06Cd

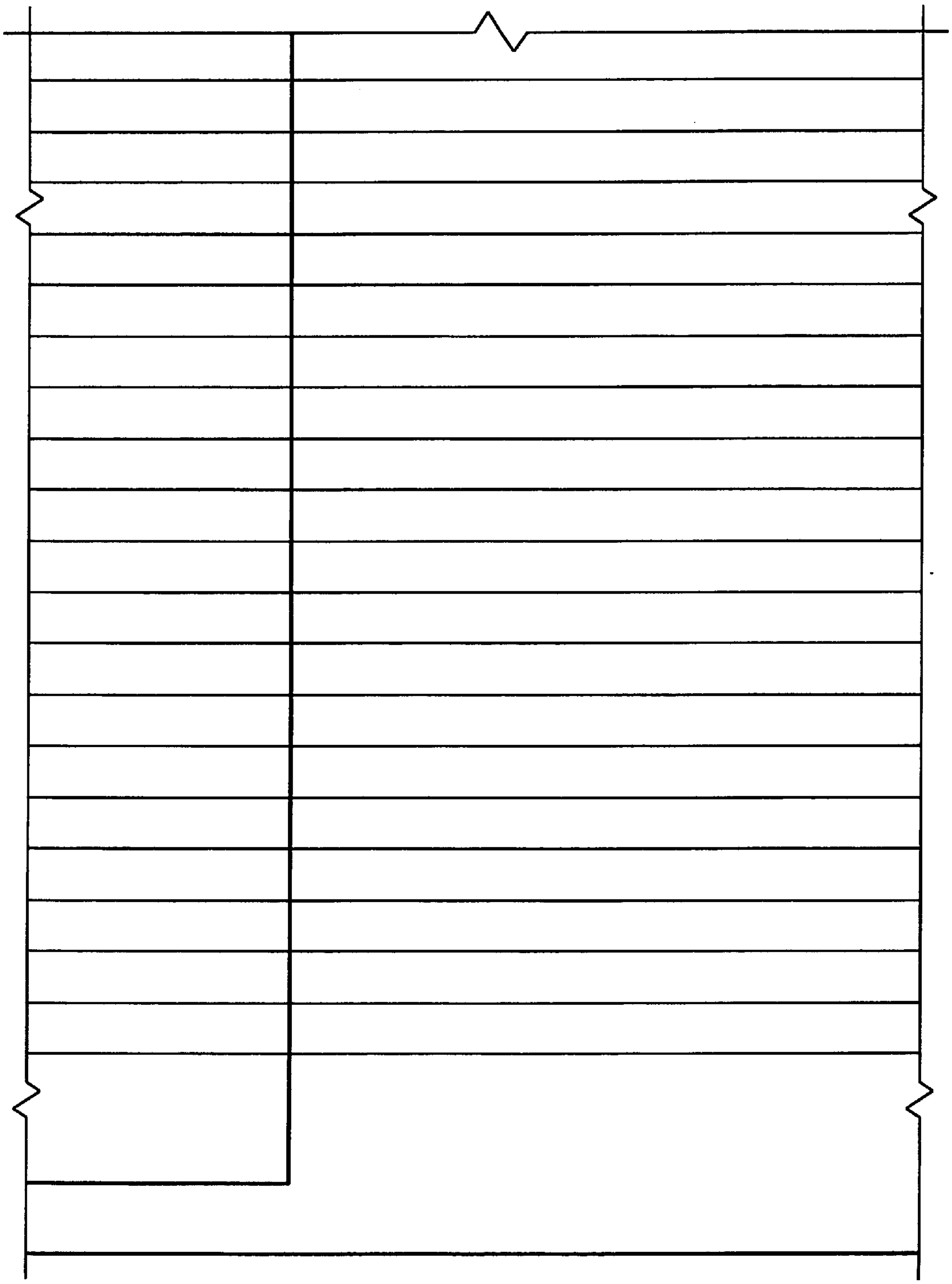
Fig 7.06CK

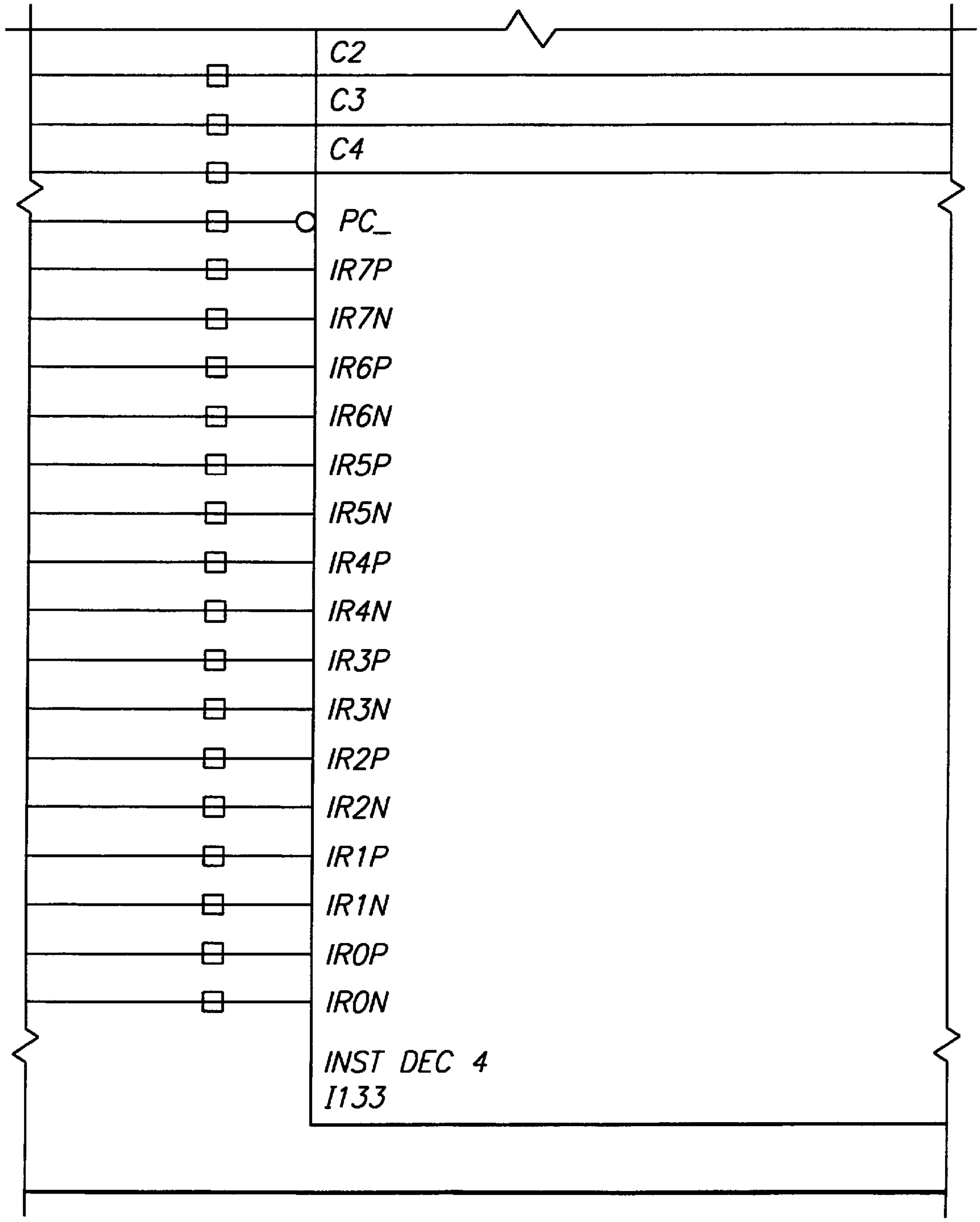
Fig 7.06CL

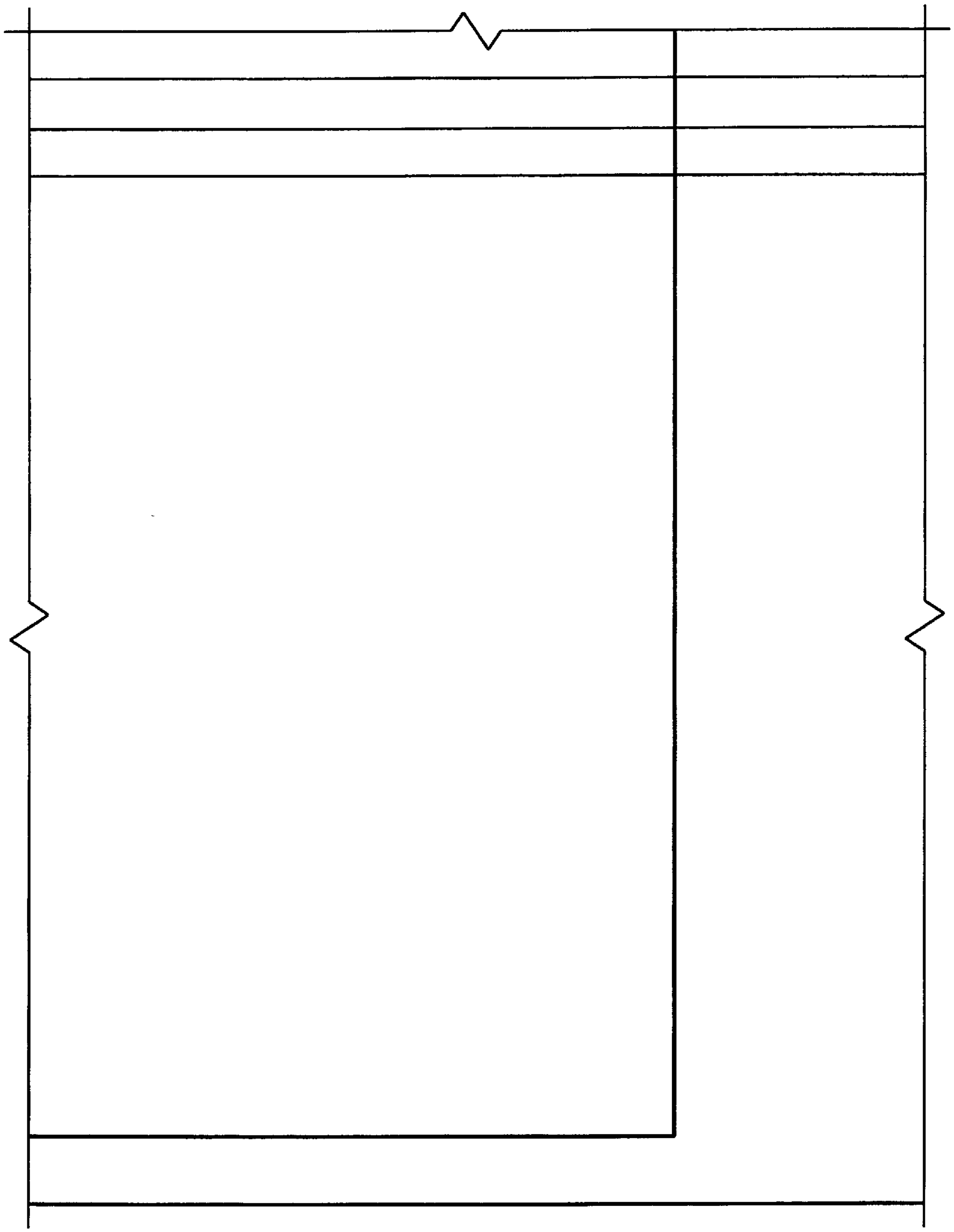
Fig 7.06CM

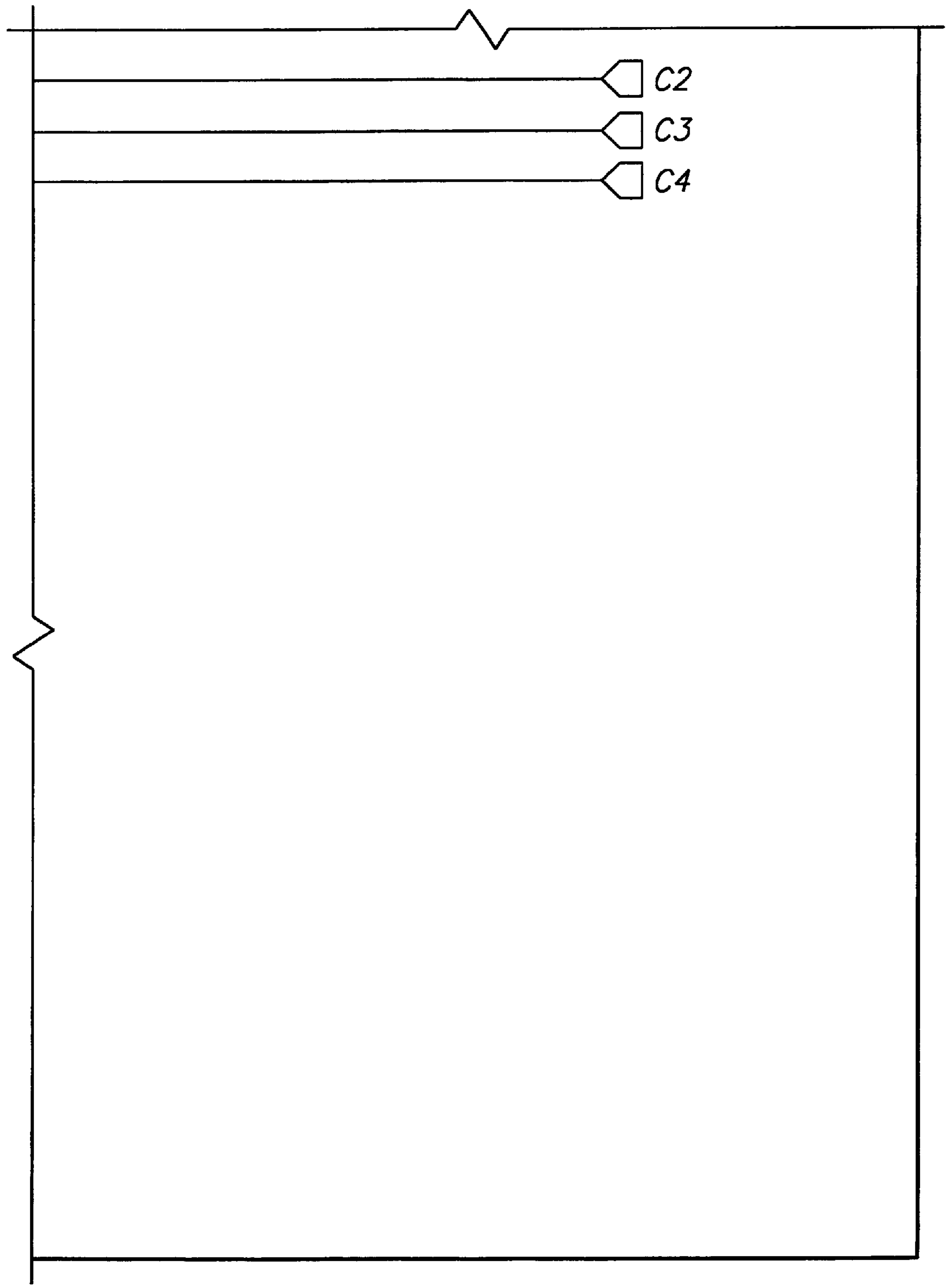
Fig 7.06CN

| | | | | | | | | |
|---|---|---|---|---|---|---|---|---|
| 7.0601AA | 7.0601AB | 7.0601AC | 7.0601AD | 7.0601AE | 7.0601AF | 7.0601AG | 7.0601AH | 7.0601AI |
| 7.0601BA | 7.0601BB | 7.0601BC | 7.0601BD | 7.0601BE | 7.0601BF | 7.0601BG | 7.0601BH | 7.0601BI |
| 7.0601CA | 7.0601CB | 7.0601CC | 7.0601CD | 7.0601CE | 7.0601CF | 7.0601CG | 7.0601CH | 7.0601CI |
| 7.0601DA | 7.0601DB | 7.0601DC | 7.0601DD | 7.0601DE | 7.0601DF | 7.0601DG | 7.0601DH | 7.0601DI |
| 7.0601EA | 7.0601EB | 7.0601EC | 7.0601ED | 7.0601EE | 7.0601EF | 7.0601EG | 7.0601EH | 7.0601EI |
| 7.0601FA | 7.0601FB | 7.0601FC | 7.0601FD | 7.0601FE | 7.0601FF | 7.0601FG | 7.0601FH | 7.0601FI |
| 7.0601GA | 7.0601GB | 7.0601GC | 7.0601GD | 7.0601GE | 7.0601GF | 7.0601GG | 7.0601GH | 7.0601GI |
| 7.0601HA | 7.0601HB | 7.0601HC | 7.0601HD | 7.0601HE | 7.0601HF | 7.0601HG | 7.0601HH | 7.0601HI |

Fig 7.0601

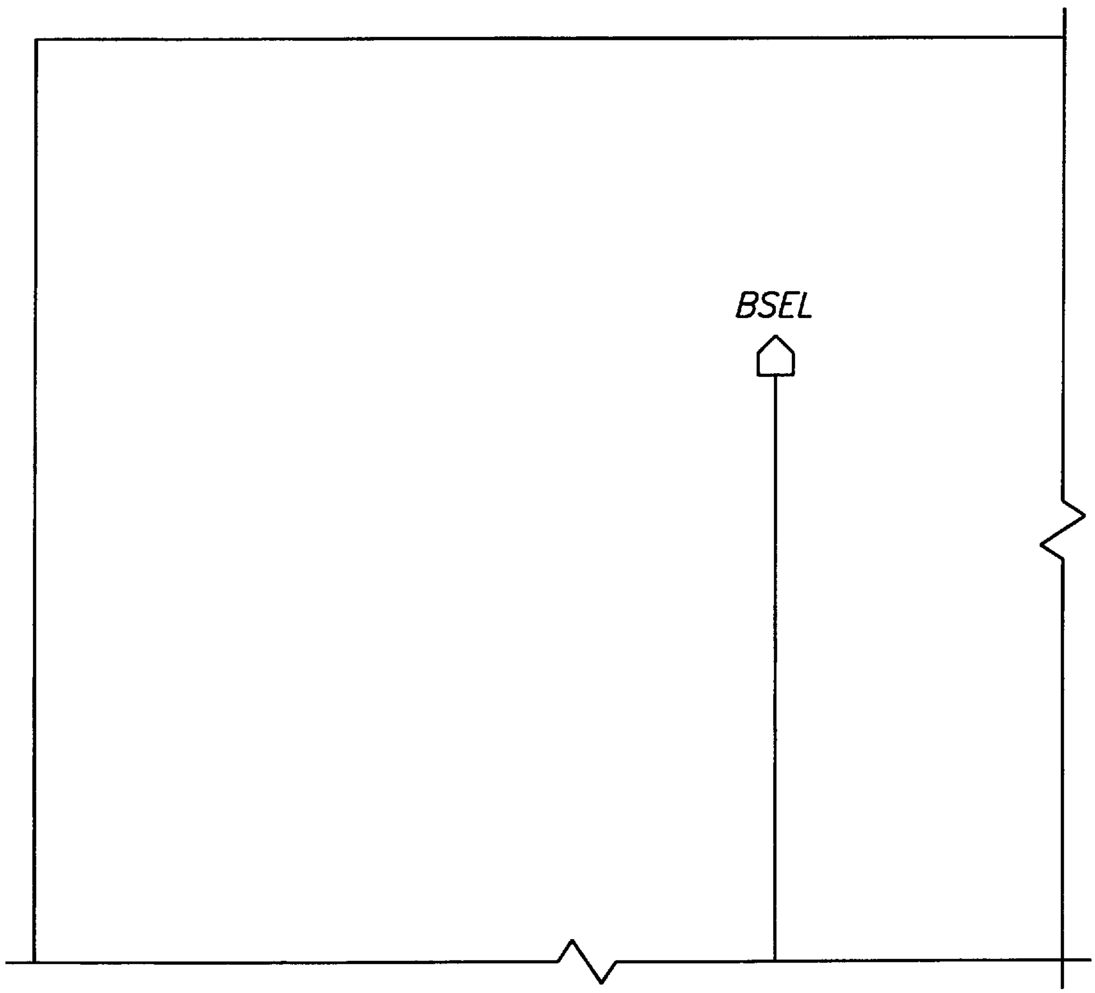
FIG 7.0601AA

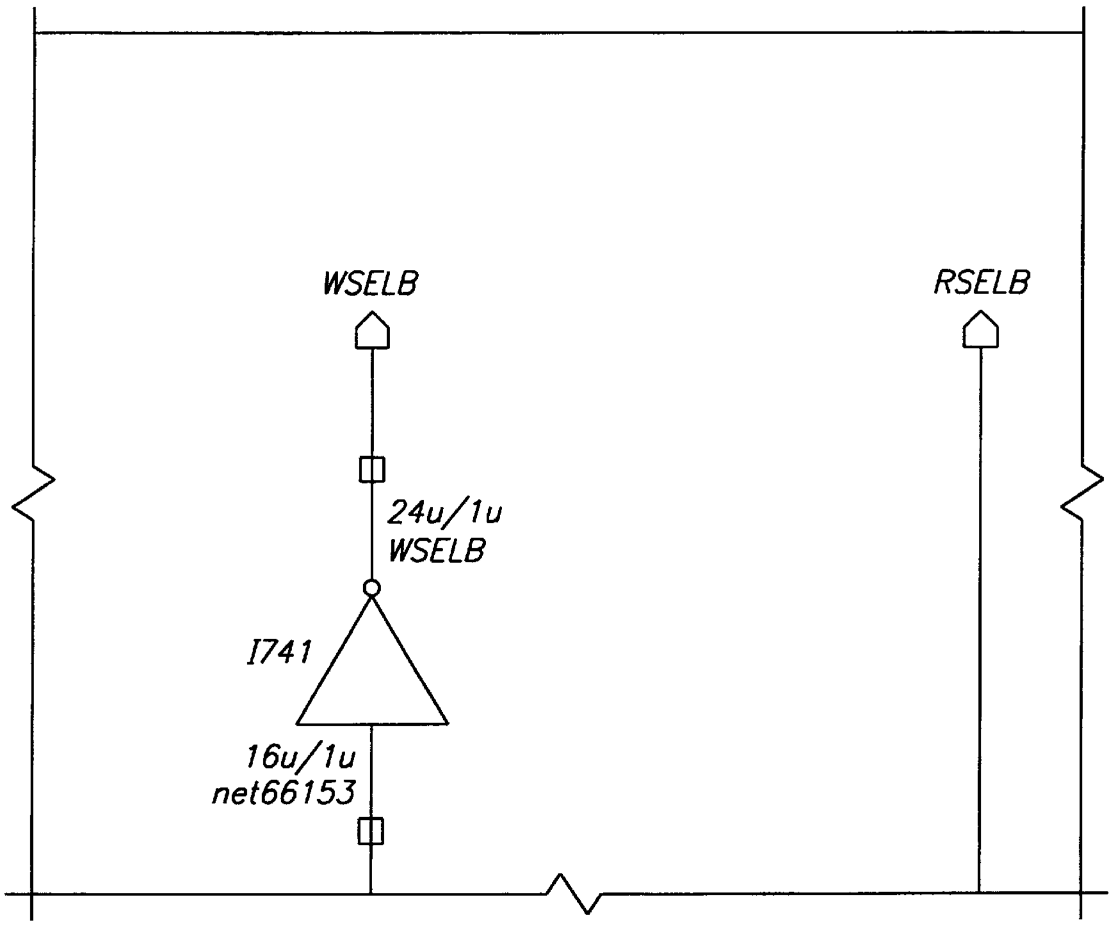
Fig 7.0601AB

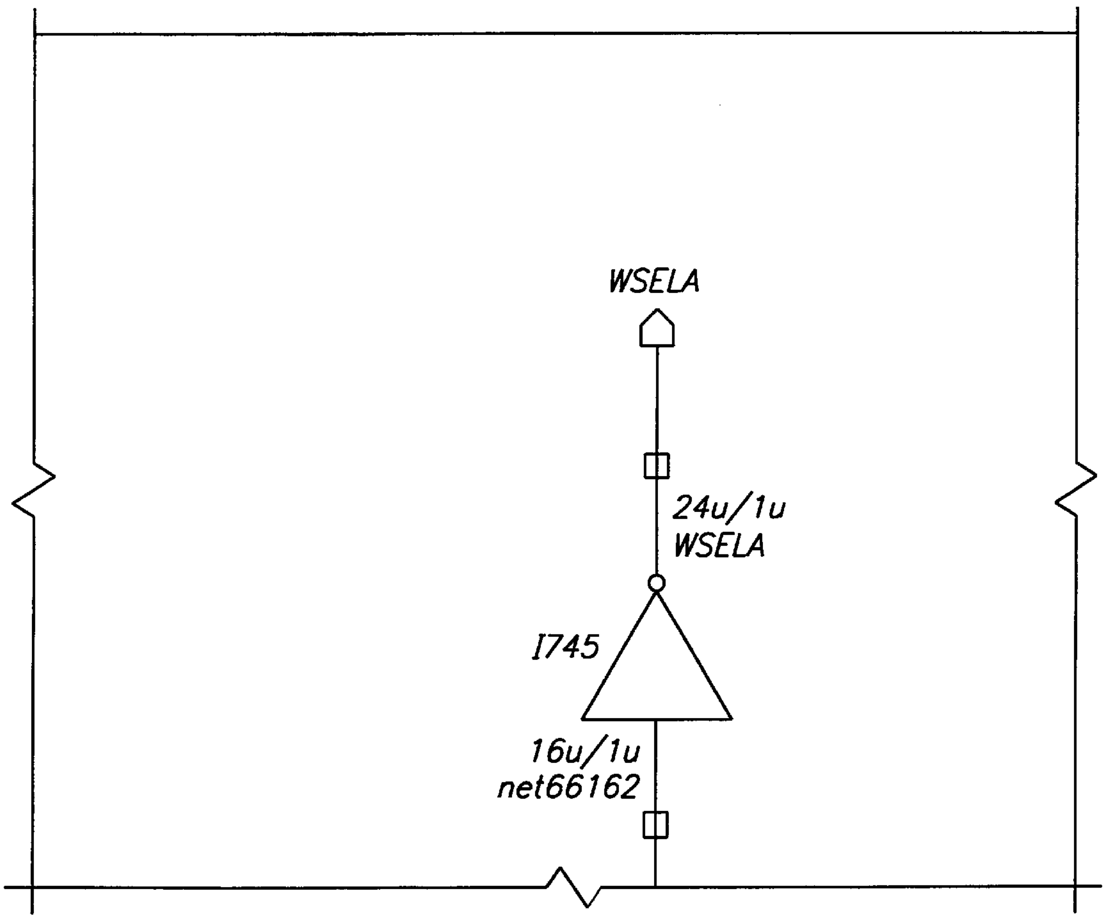
Fig 7.0601AC

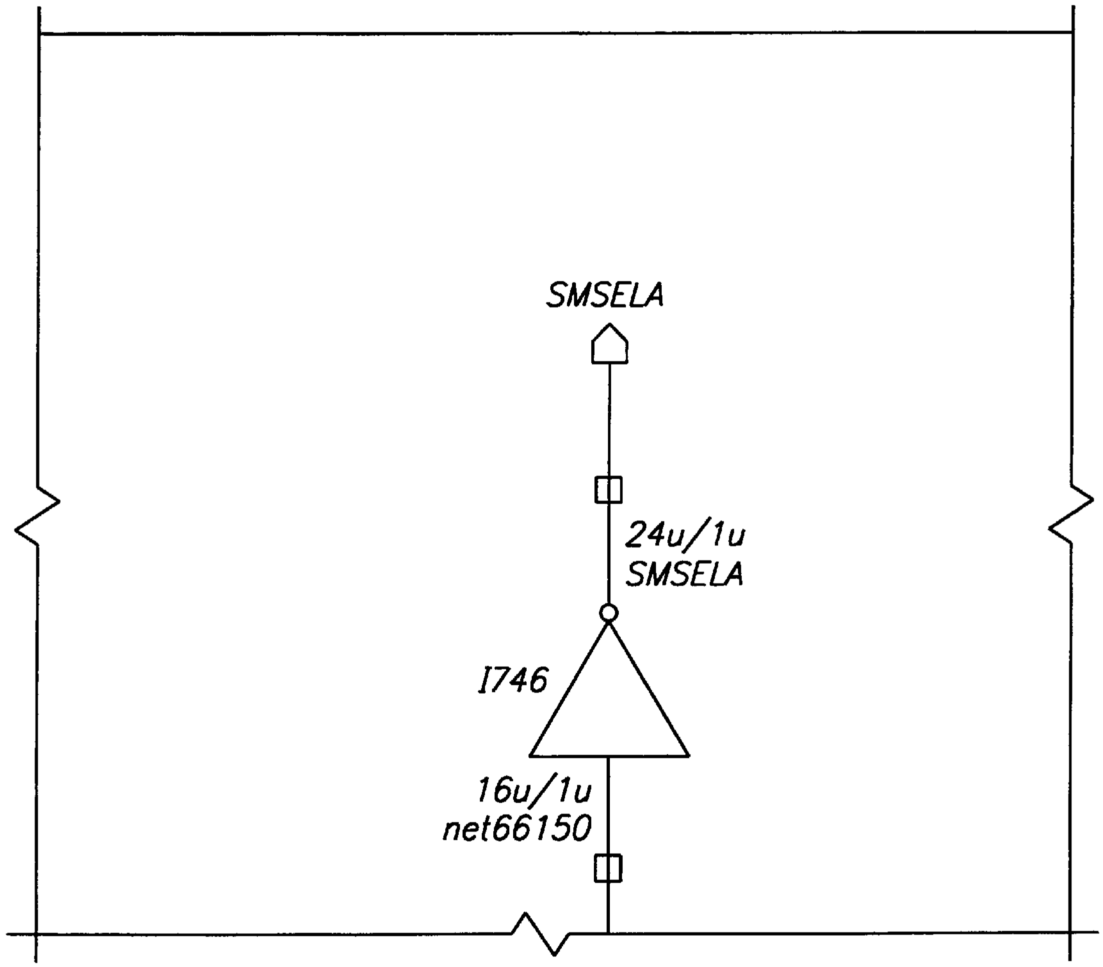
Fig 1.0601AD

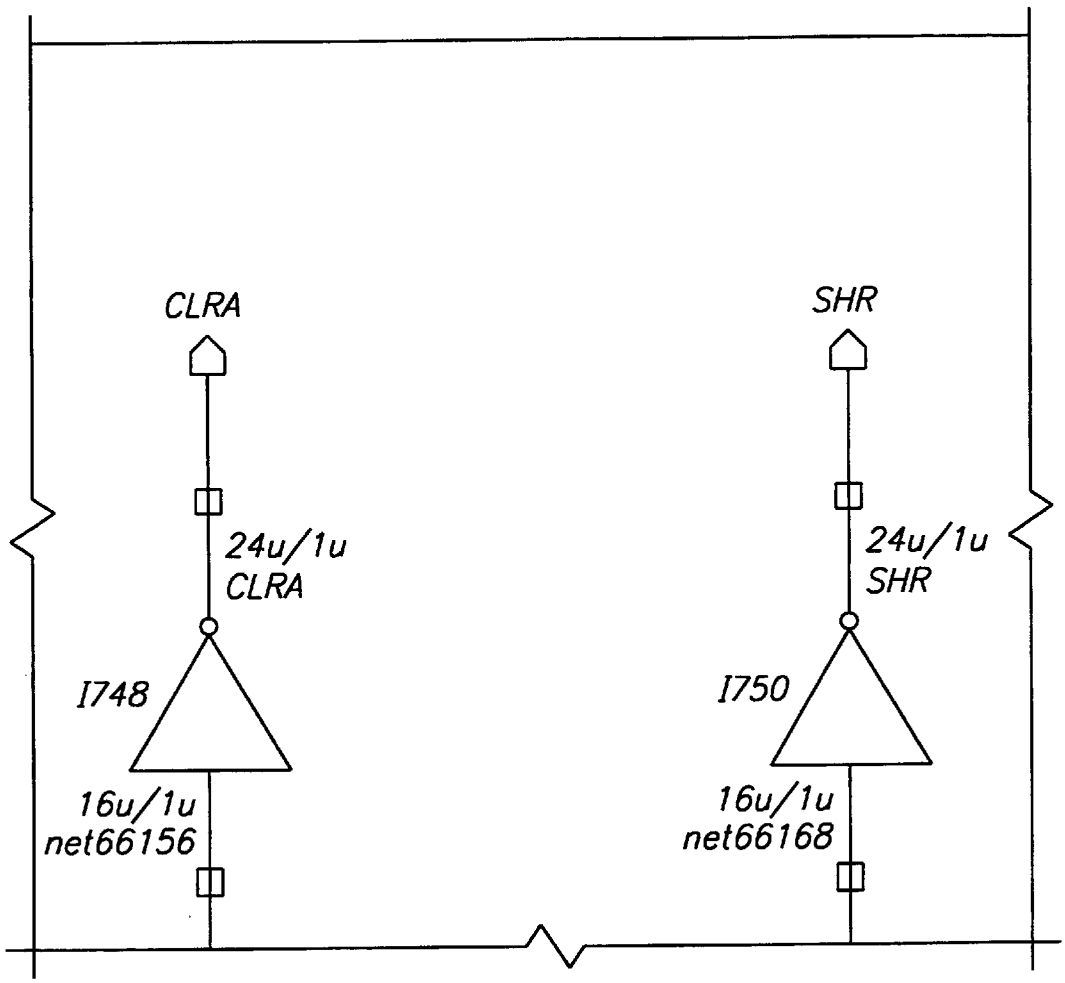
Fig 7.0601AE

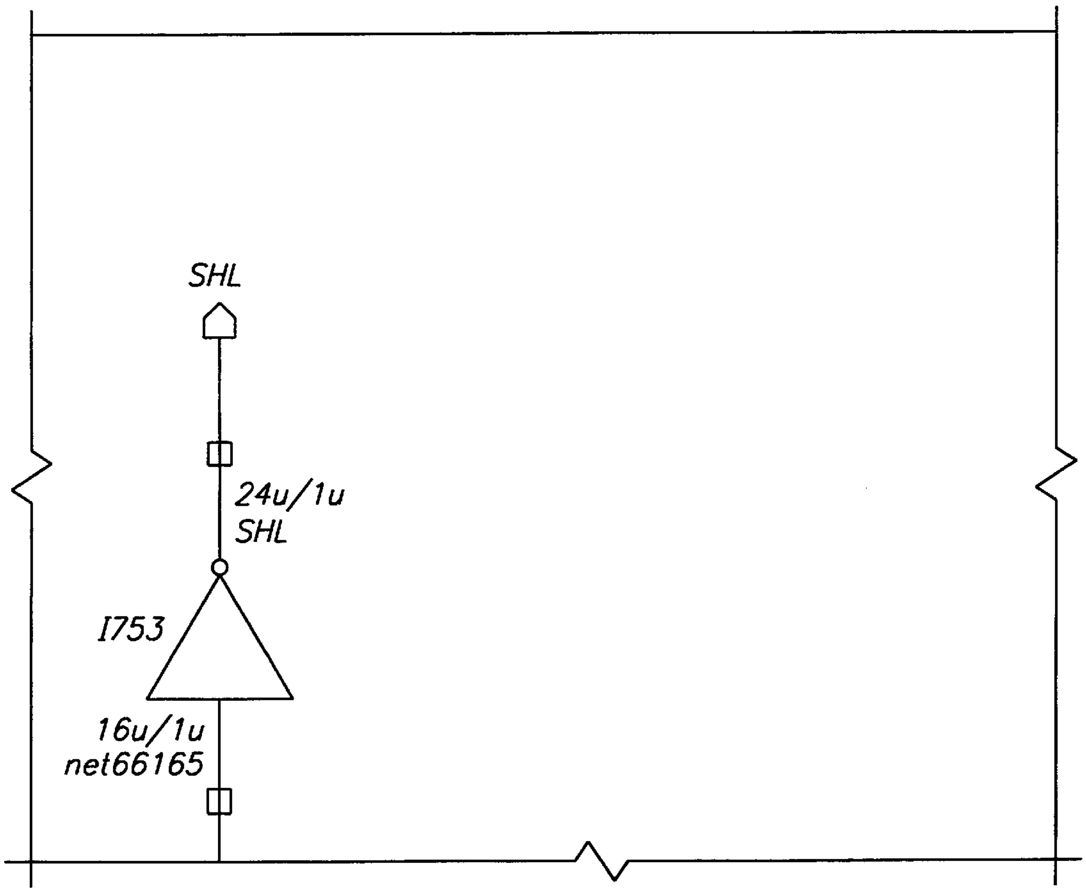
Fig 1.0601AF

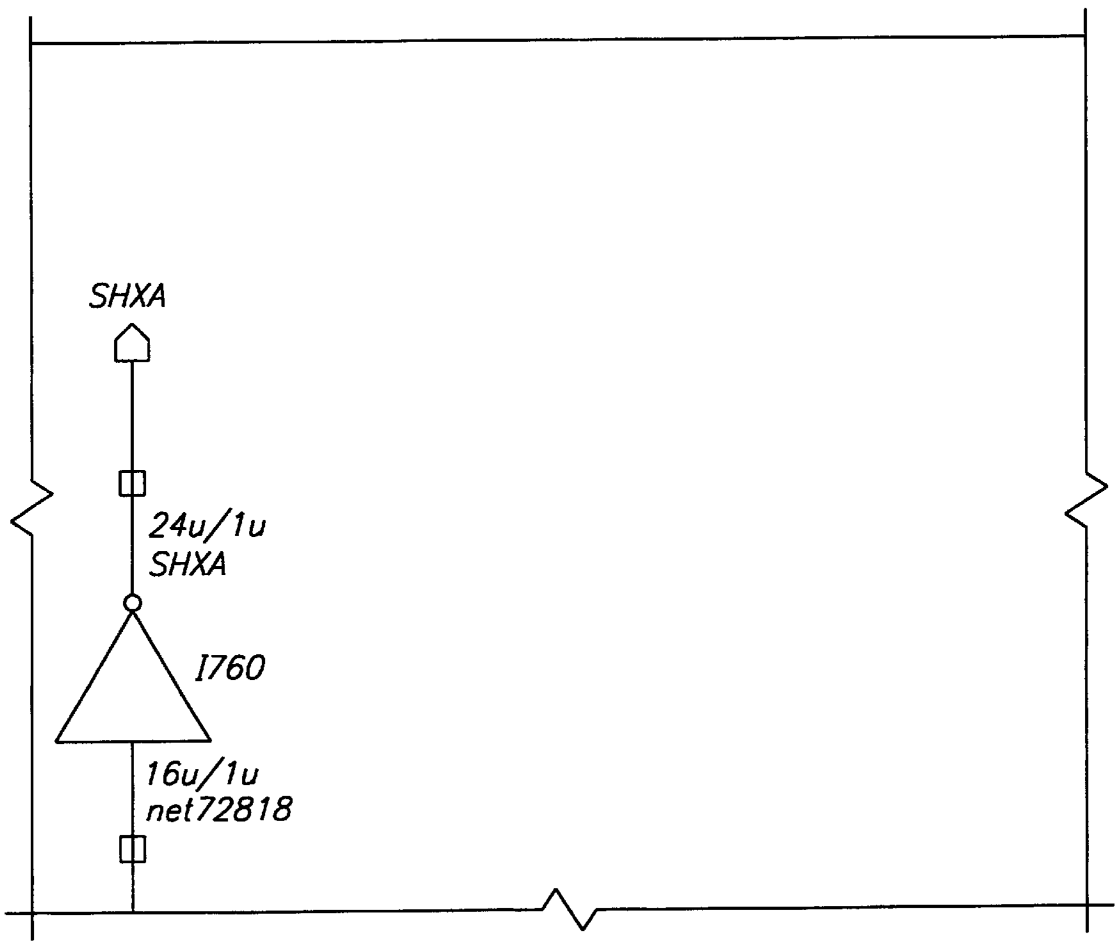
Fig 1.0601AG

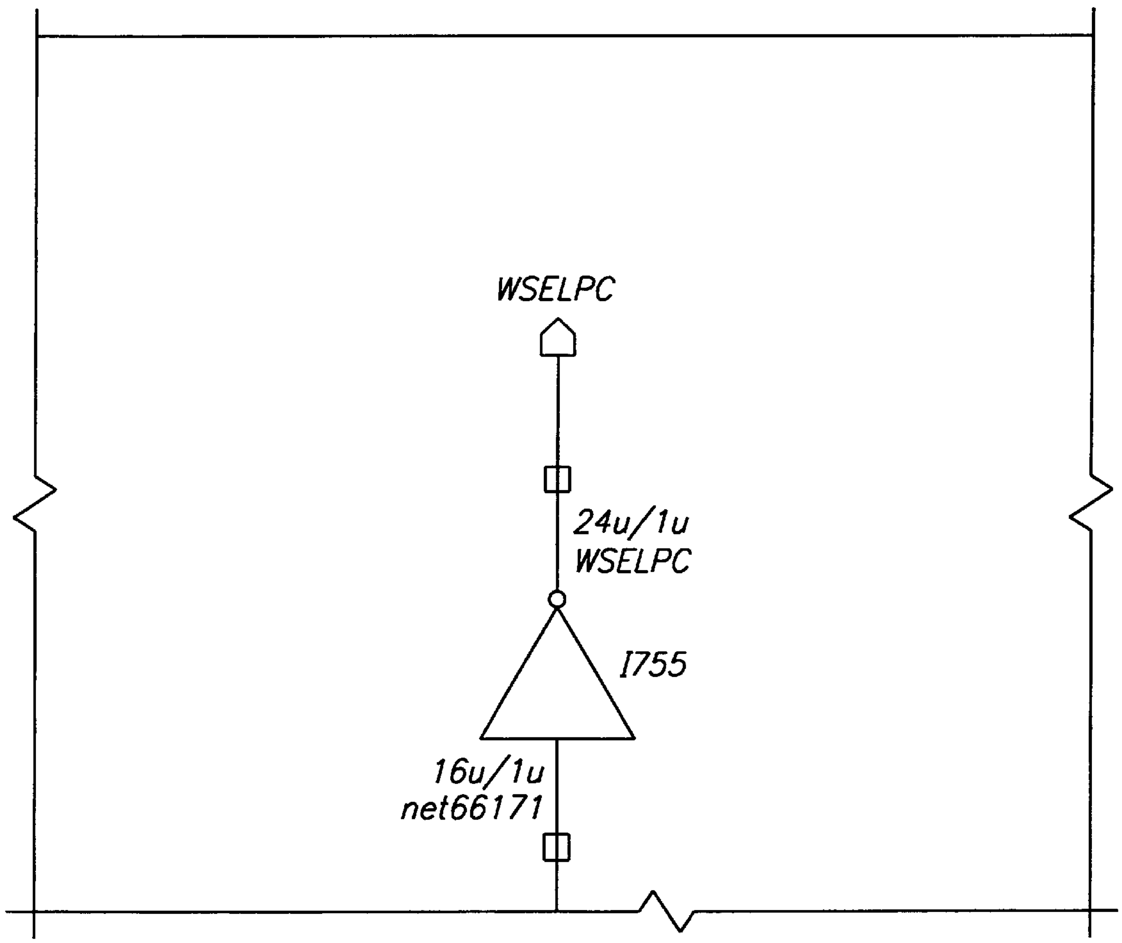
Fig 7.0601AH

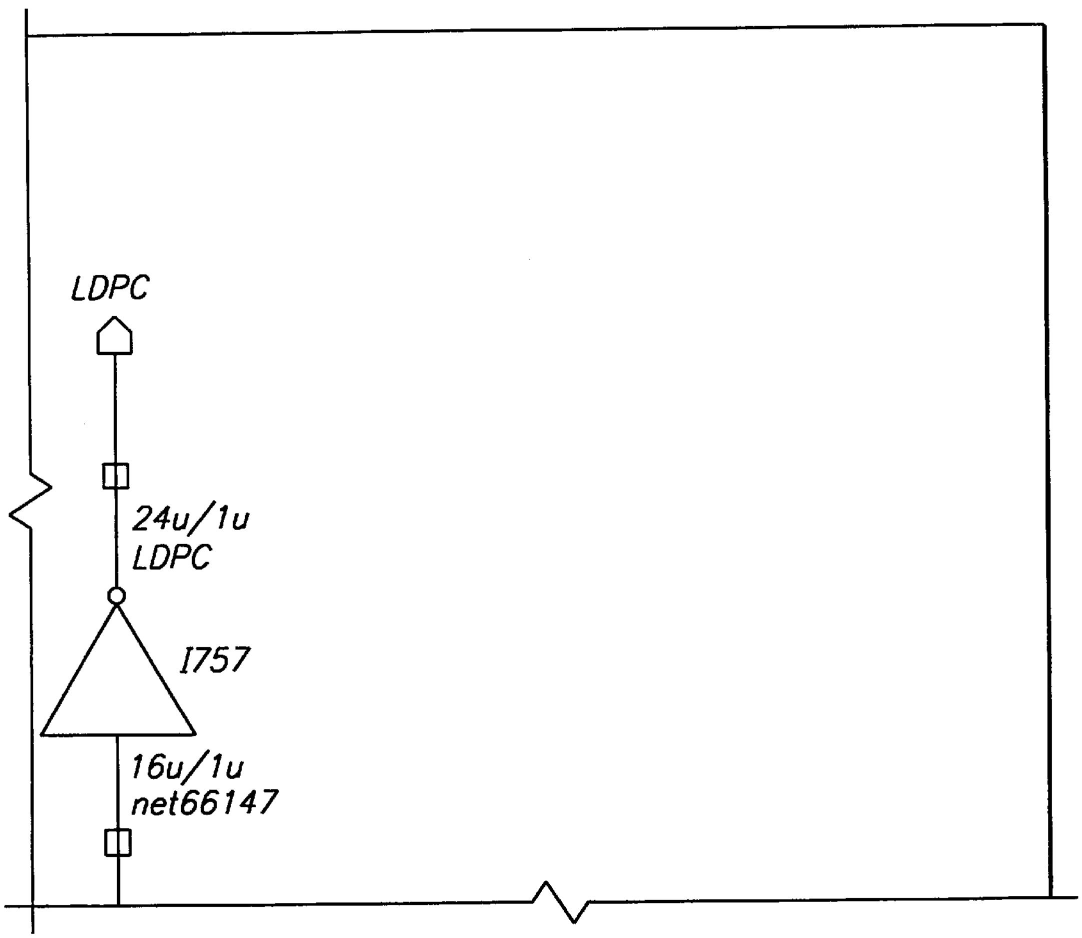
Fig 7.0601AI

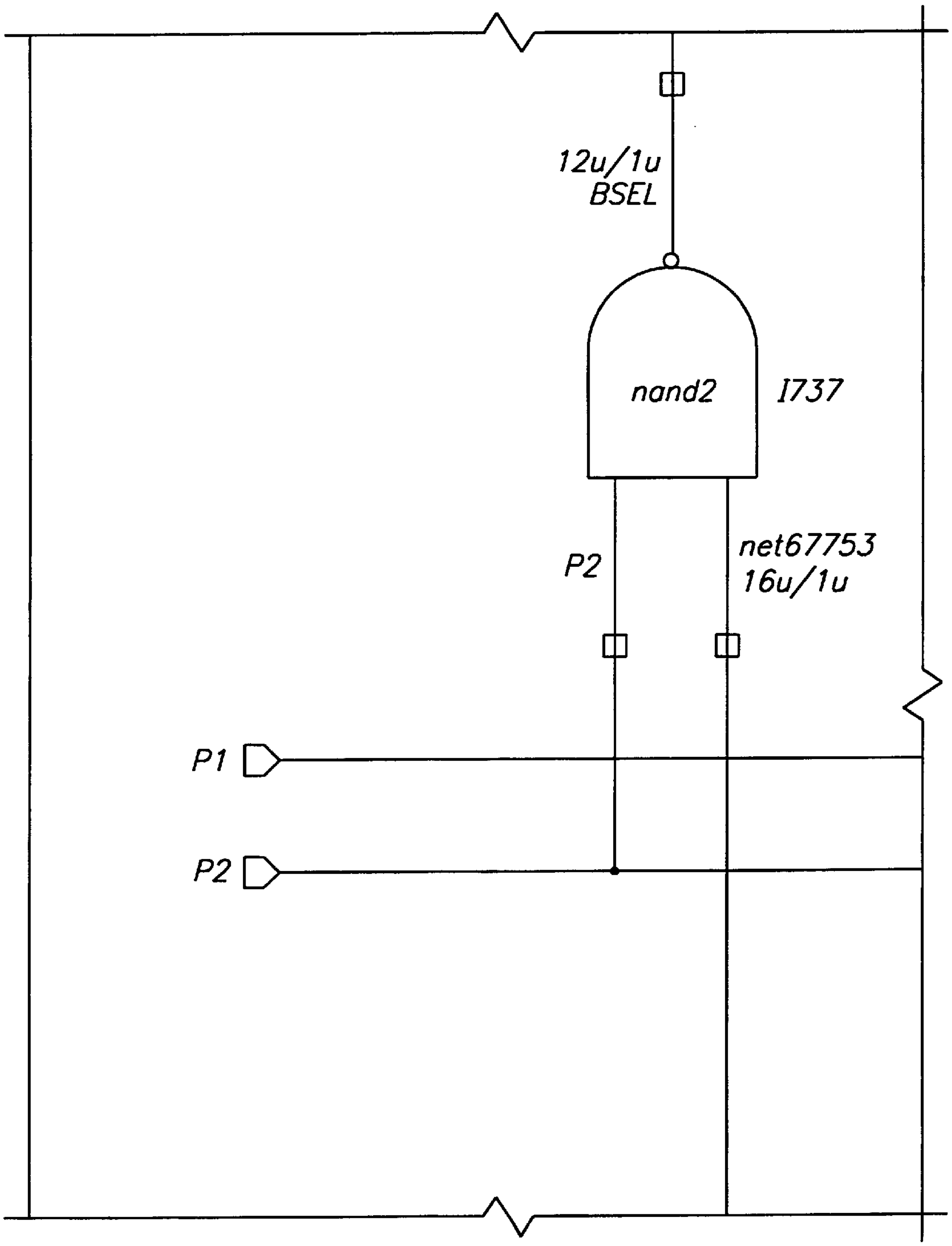
Fig 7.0601BA

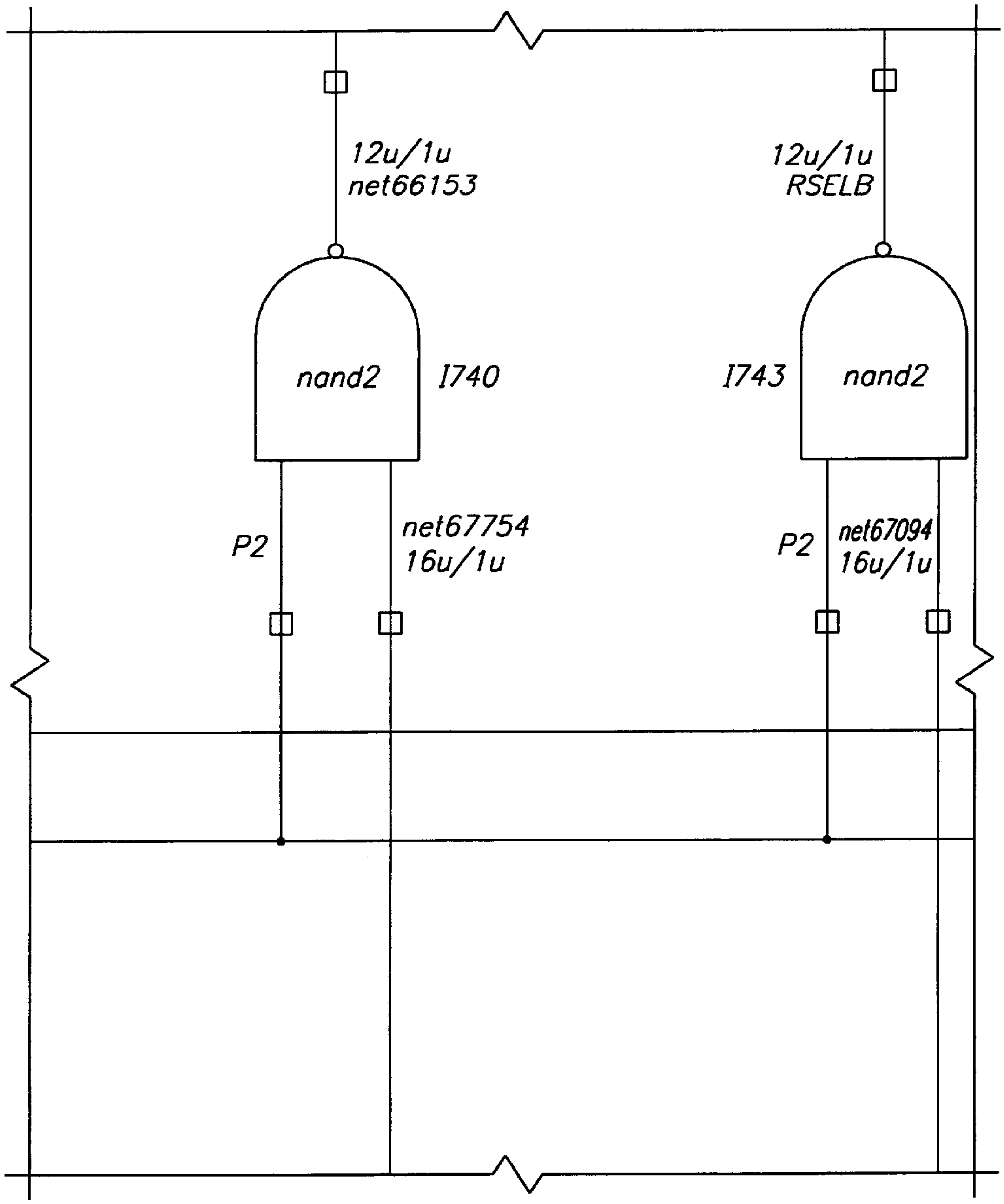
Fig 1.0601BB

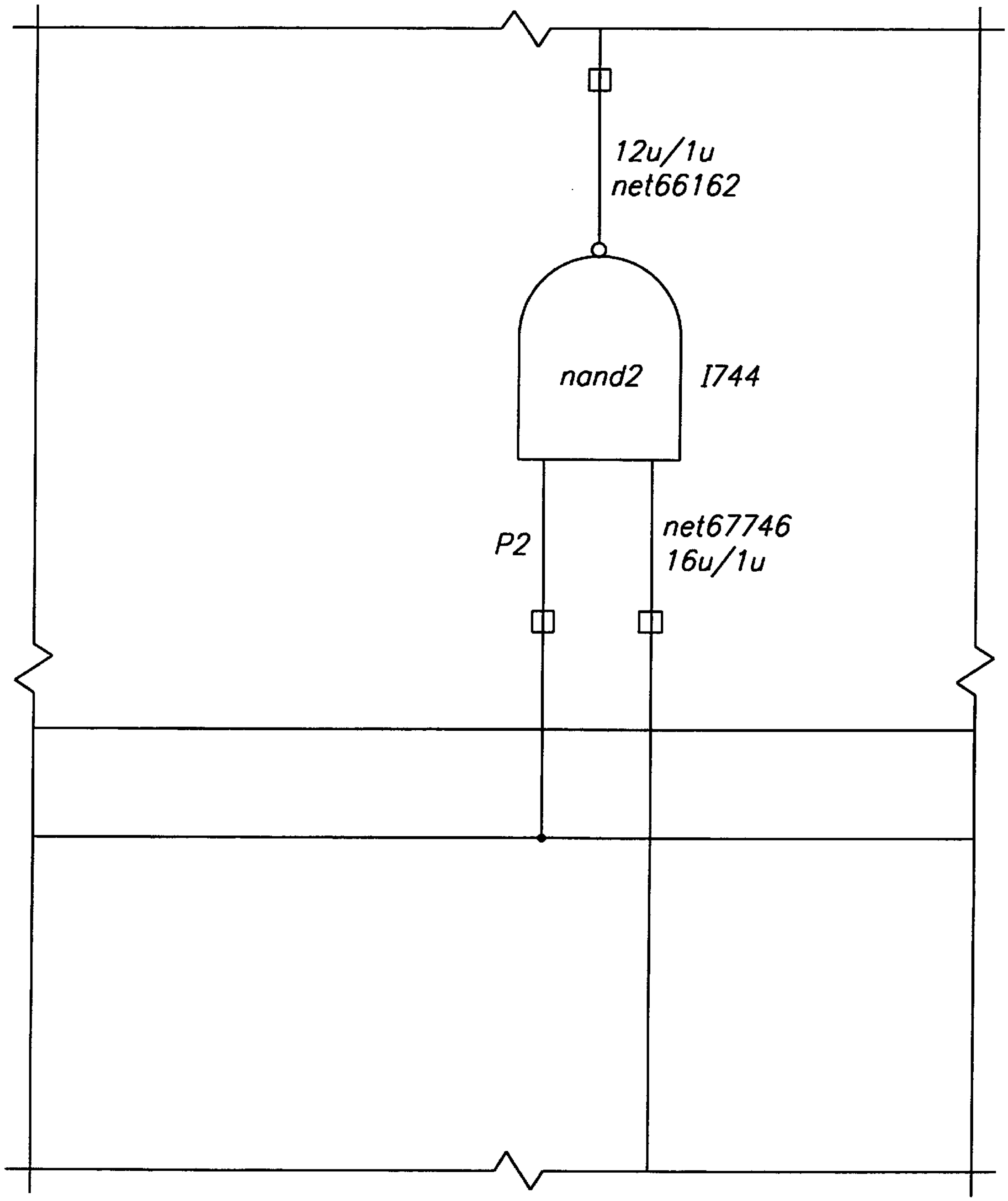
Fig 7.0601BC

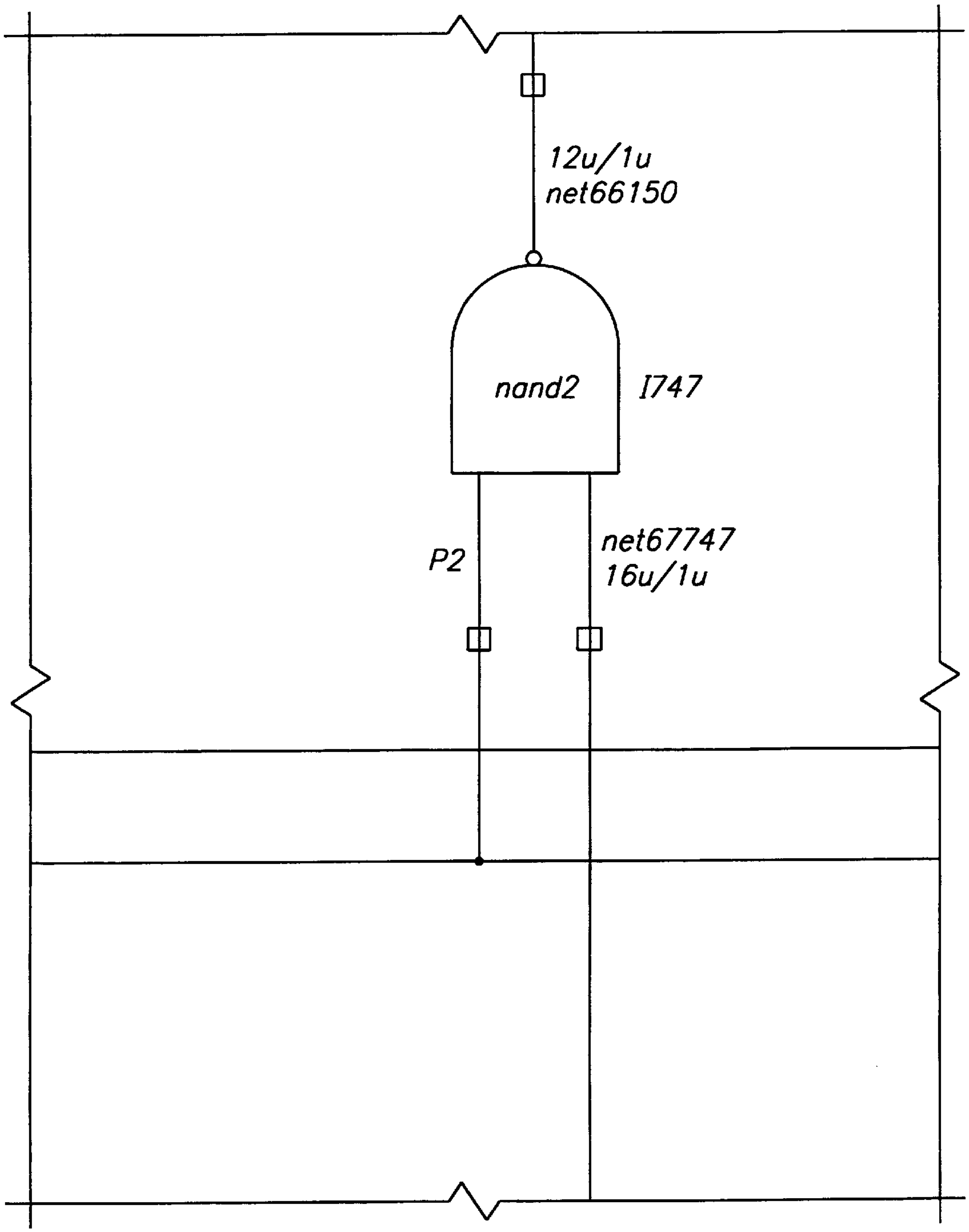
Fig 1.0601BD

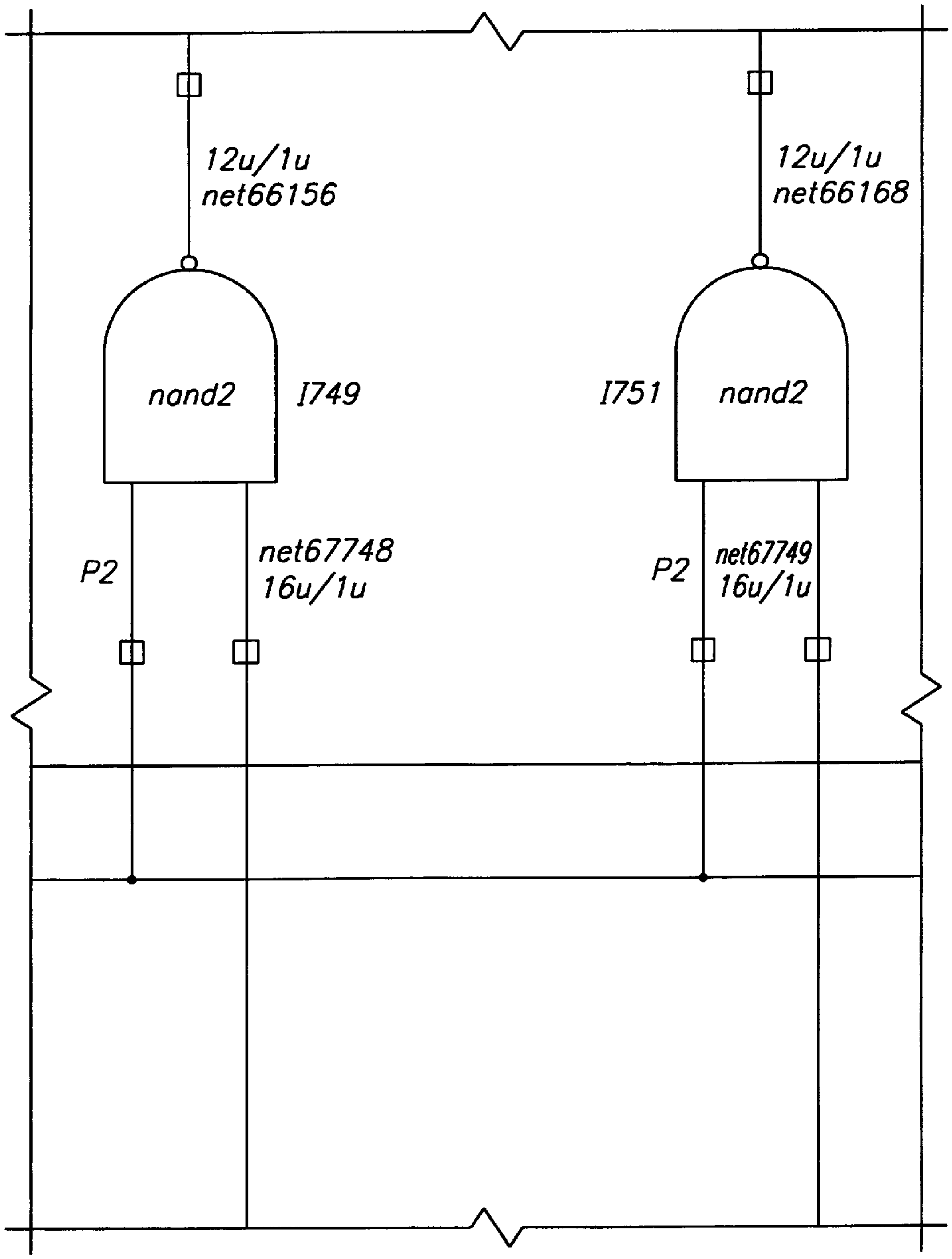
FIG 1.0601BE

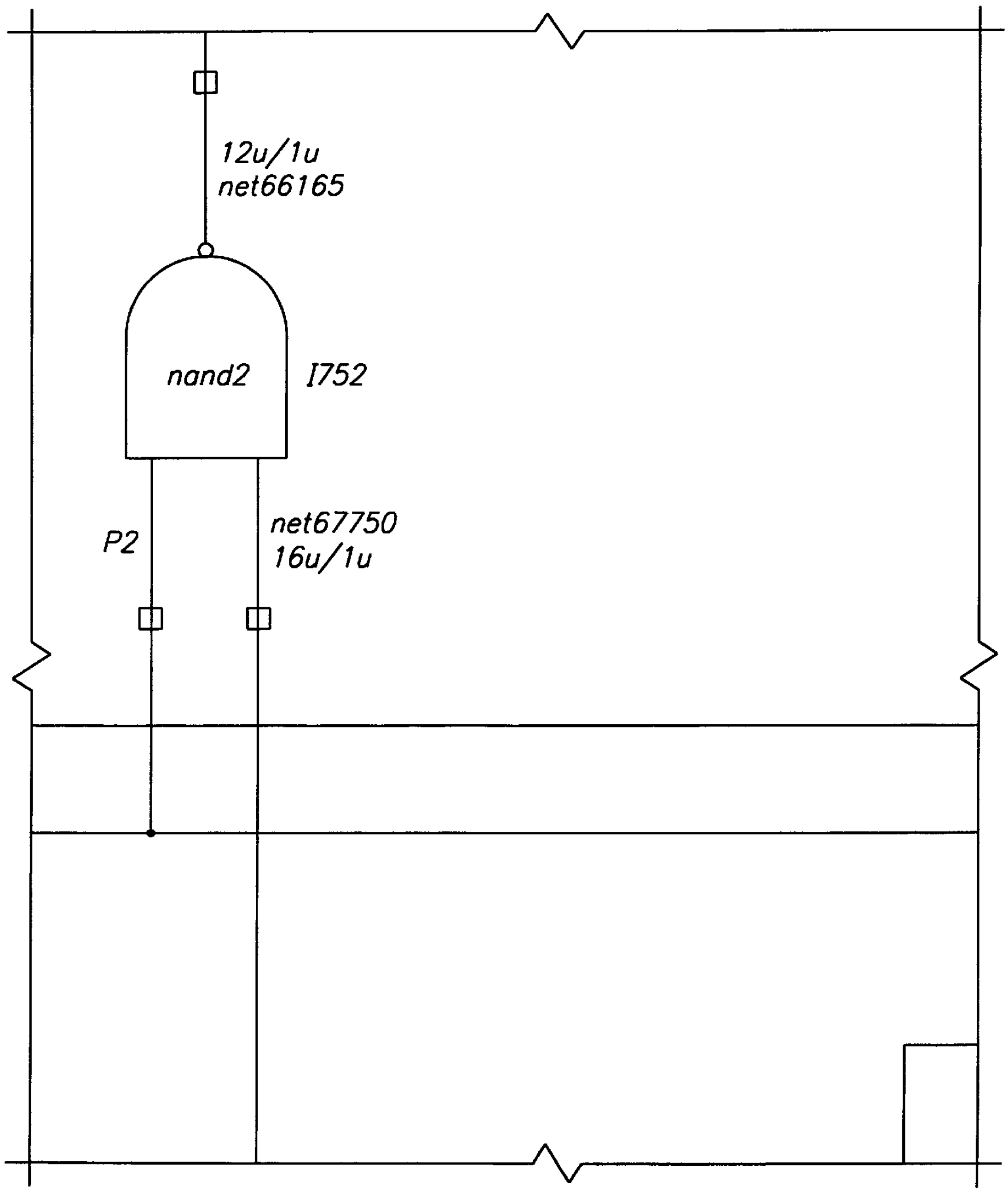
Fig 1.0601BF

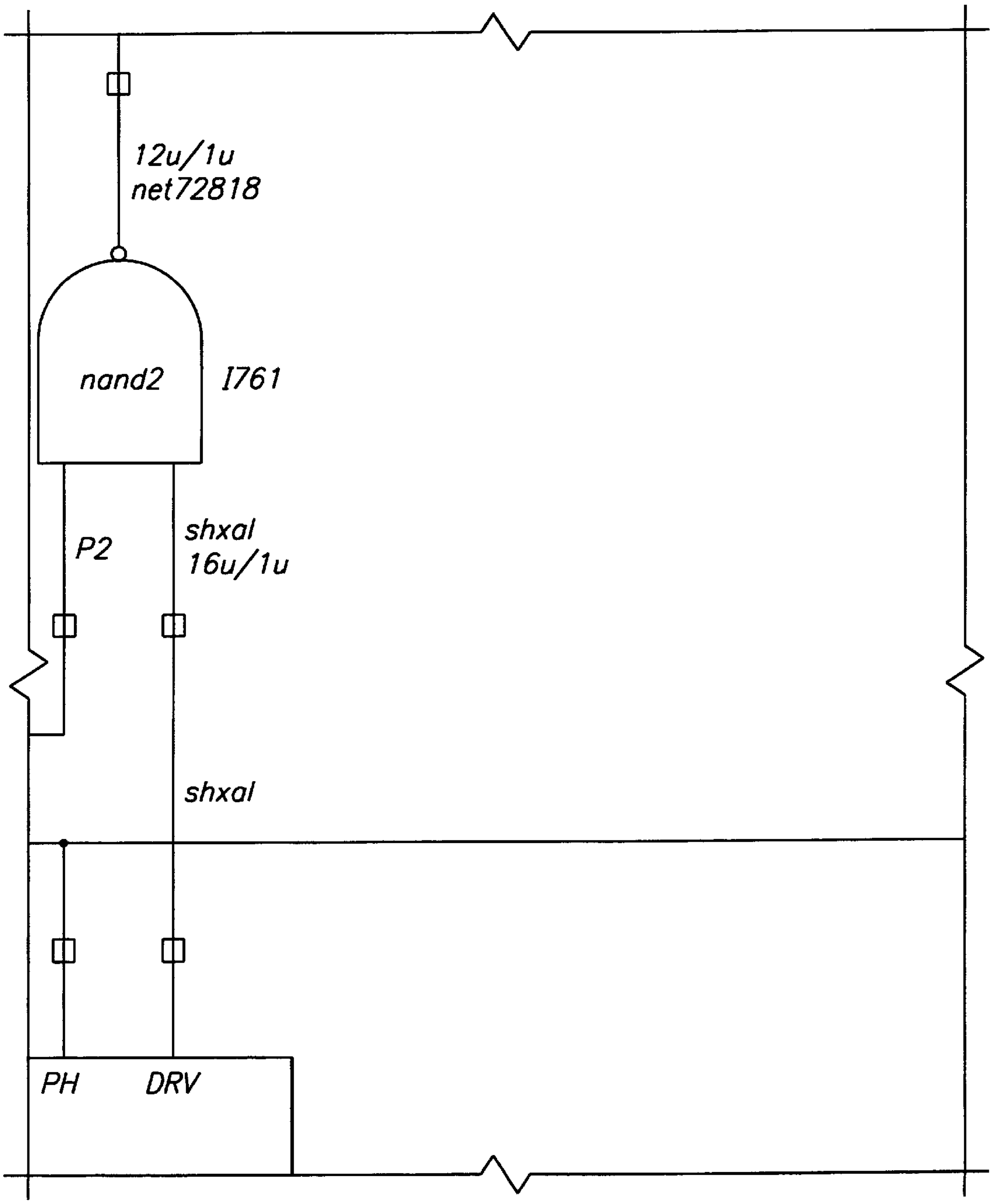
Fig 7.0601BG

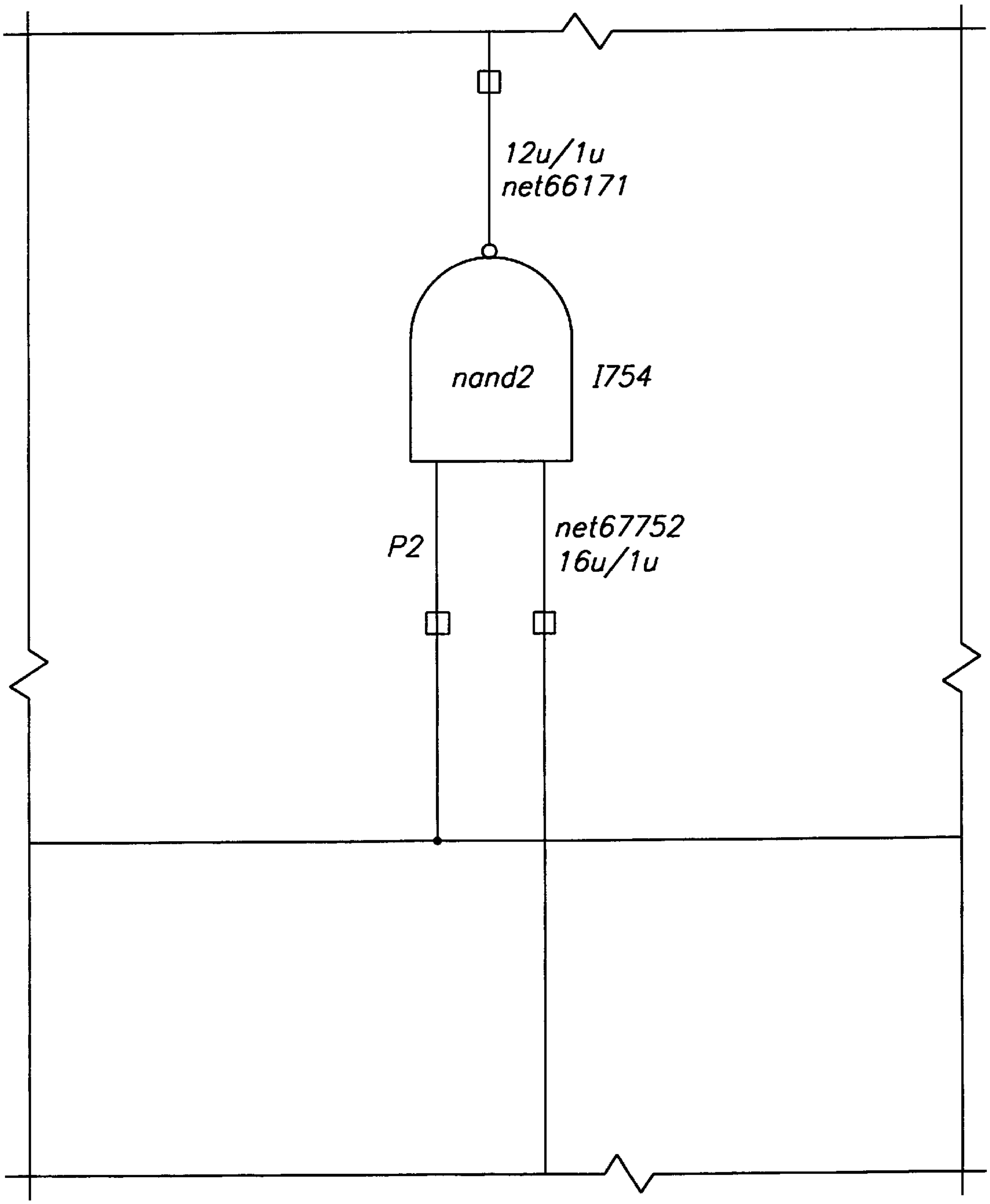
Fig 7.0601BH

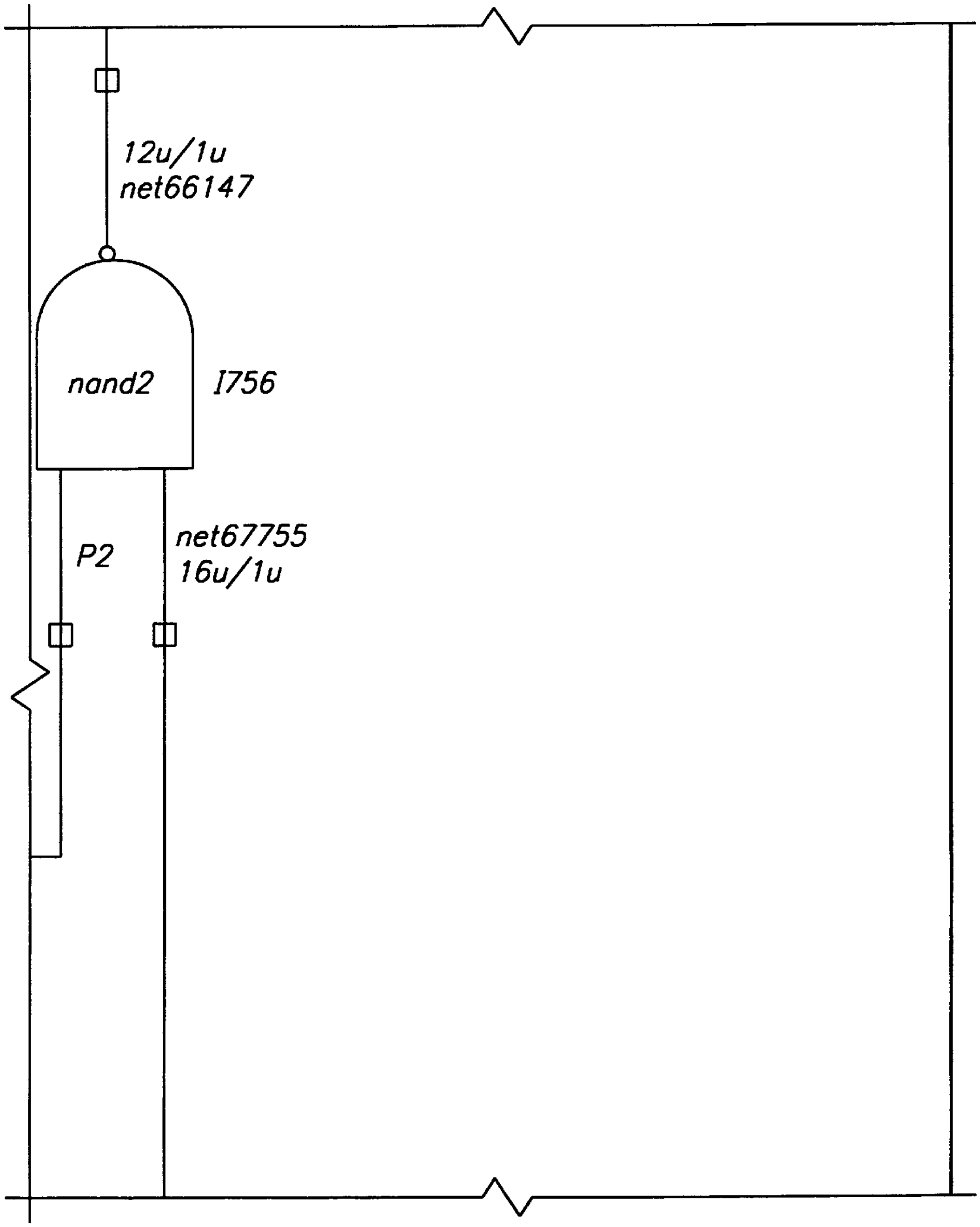
Fig 7.0601B1

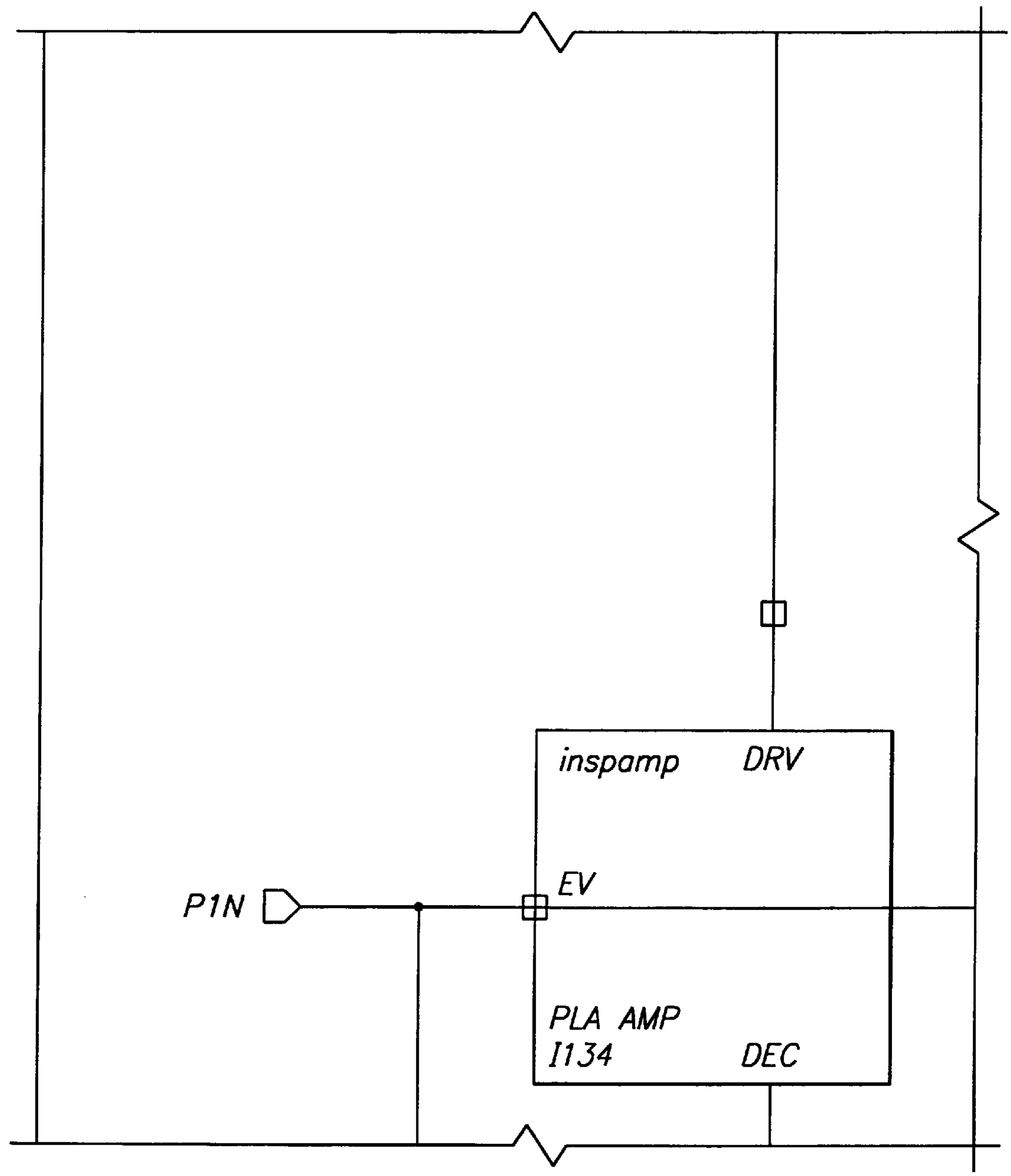
Fig 7.0601CA

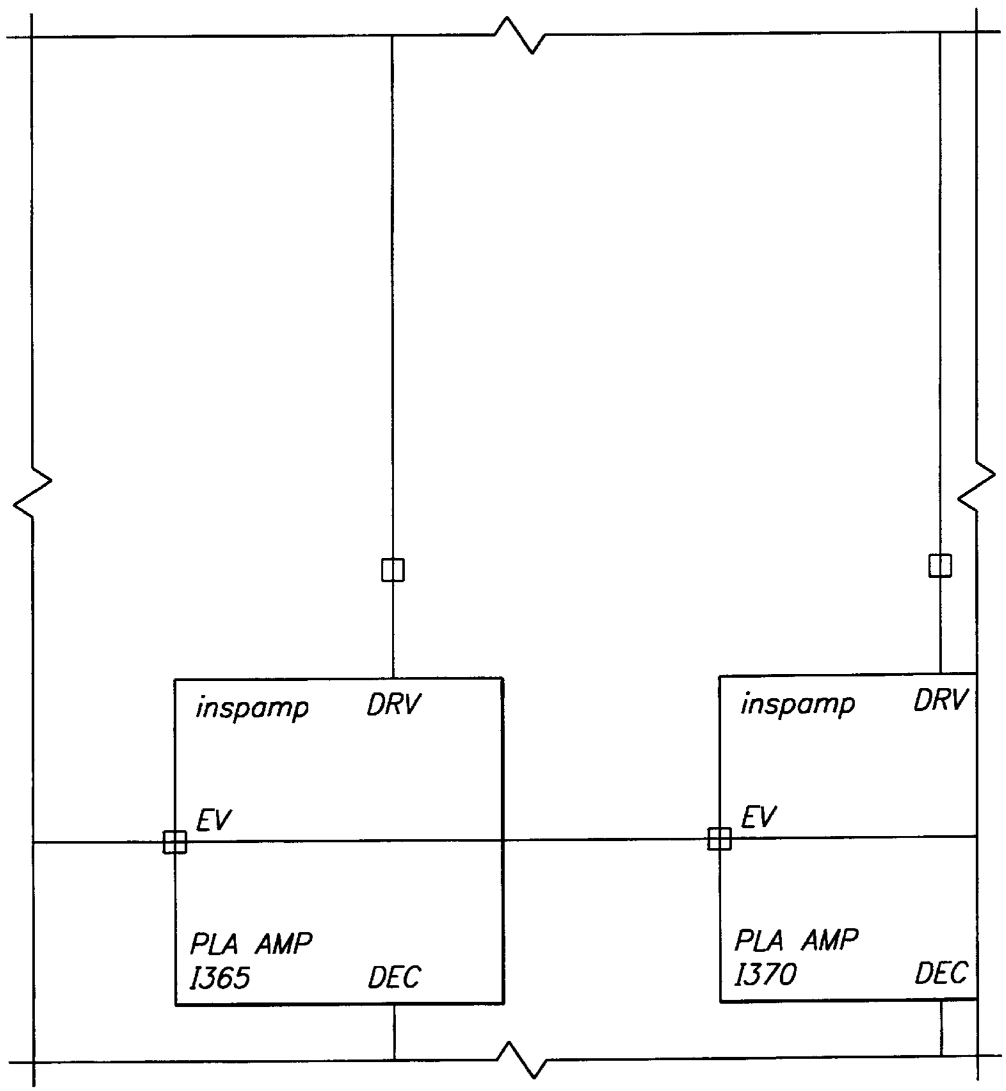
Fig 7.0601CB

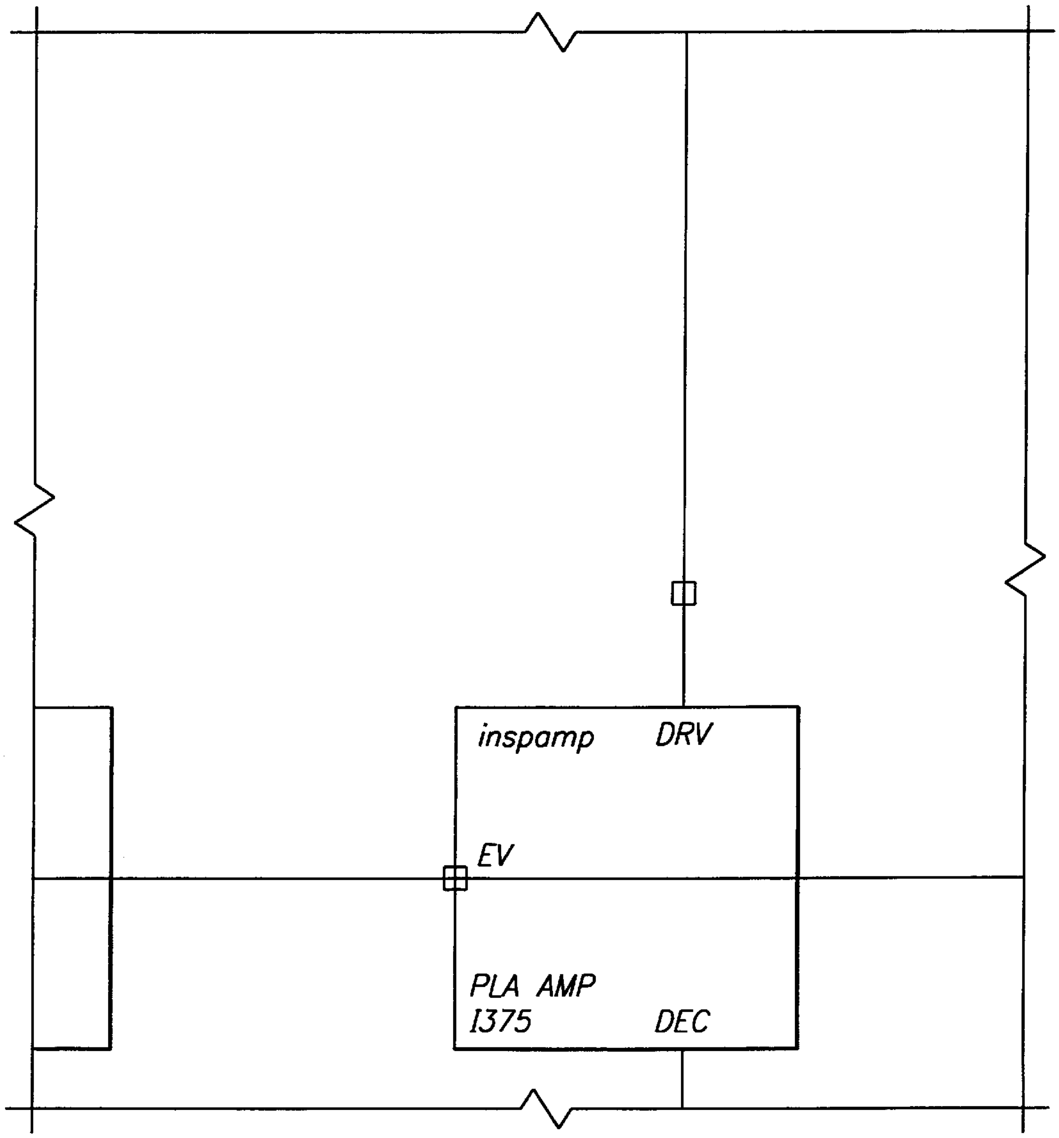
Fig 1.060ICC

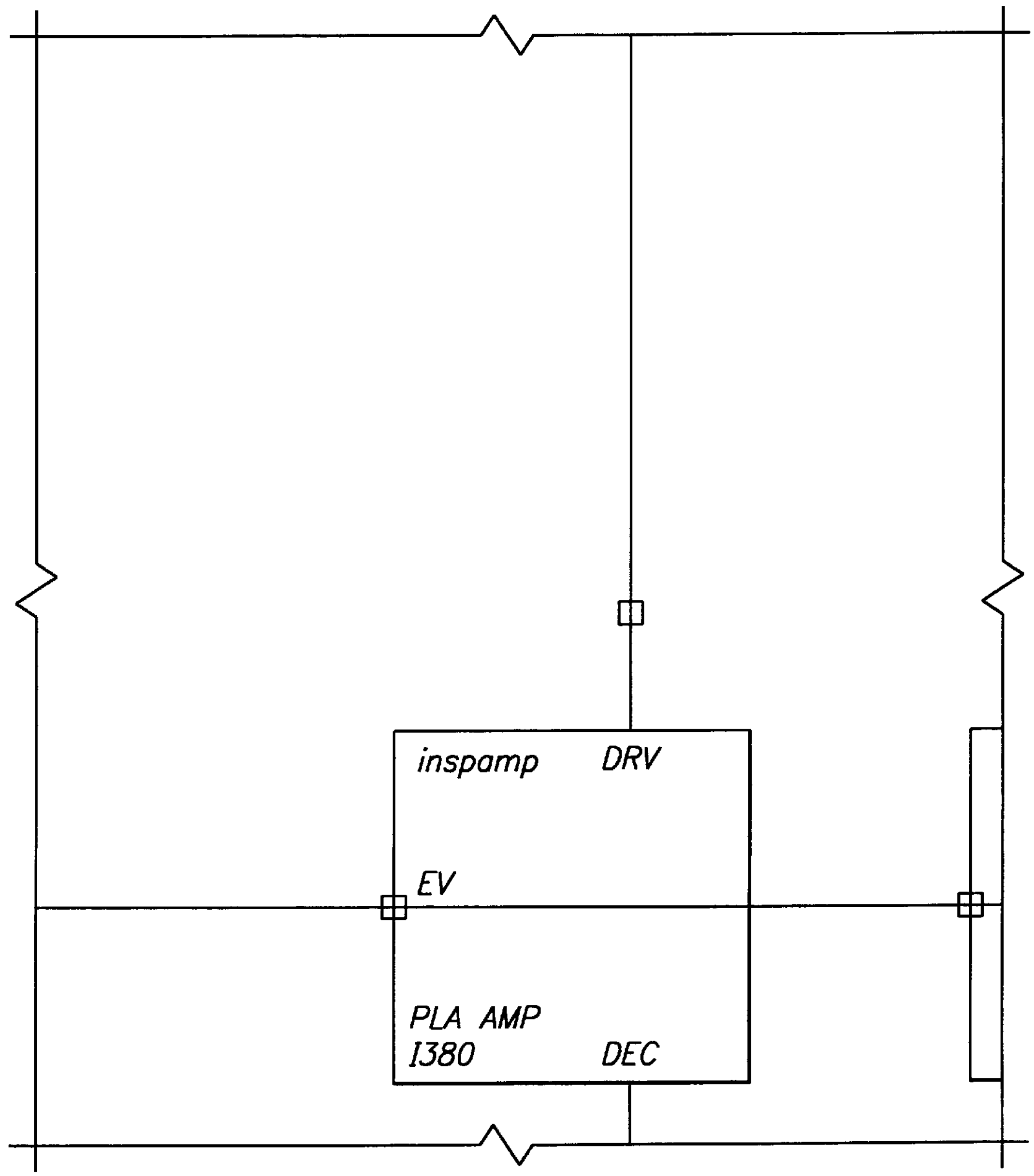
Fig 7.0601CD

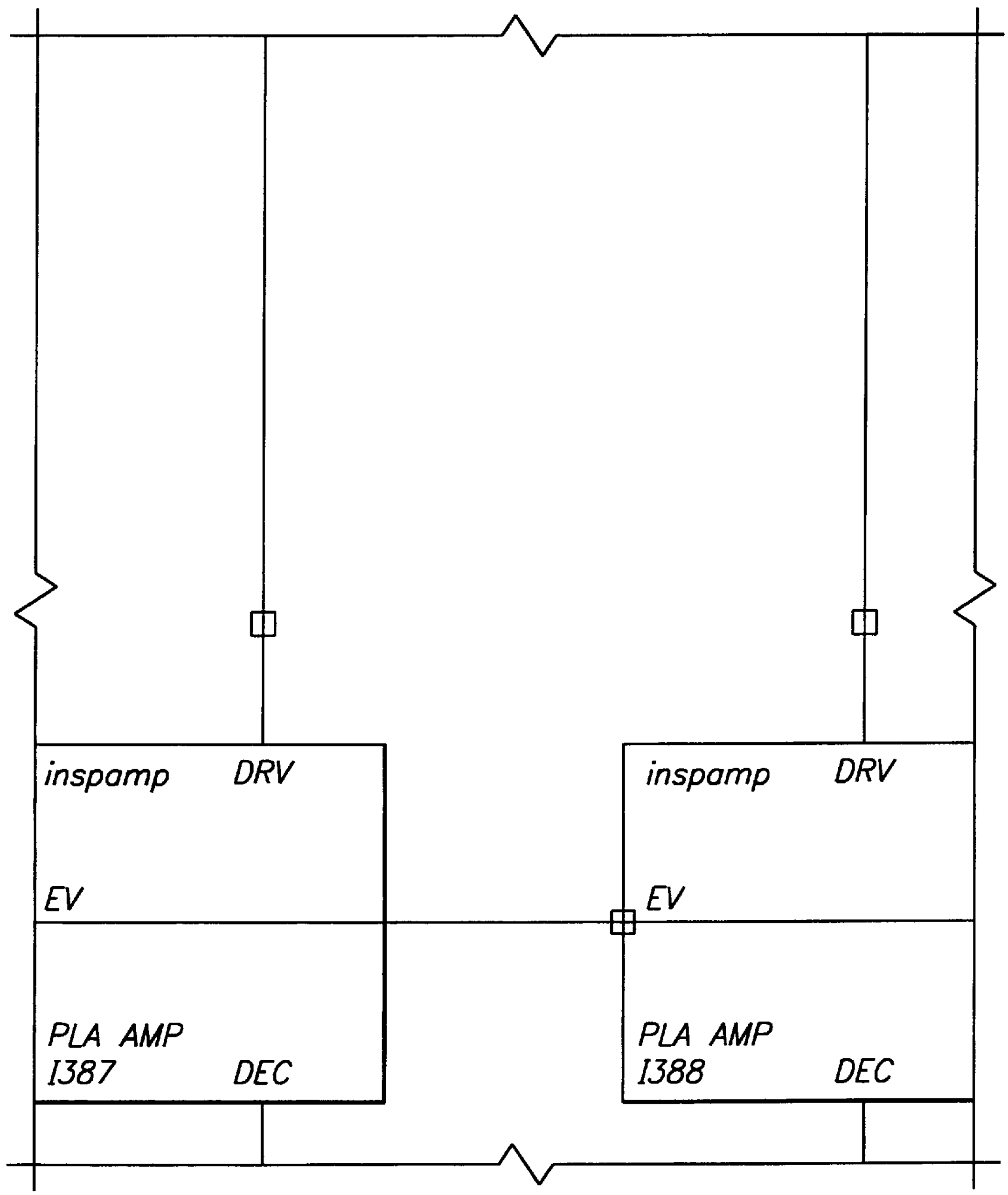
Fig 1.0601CE

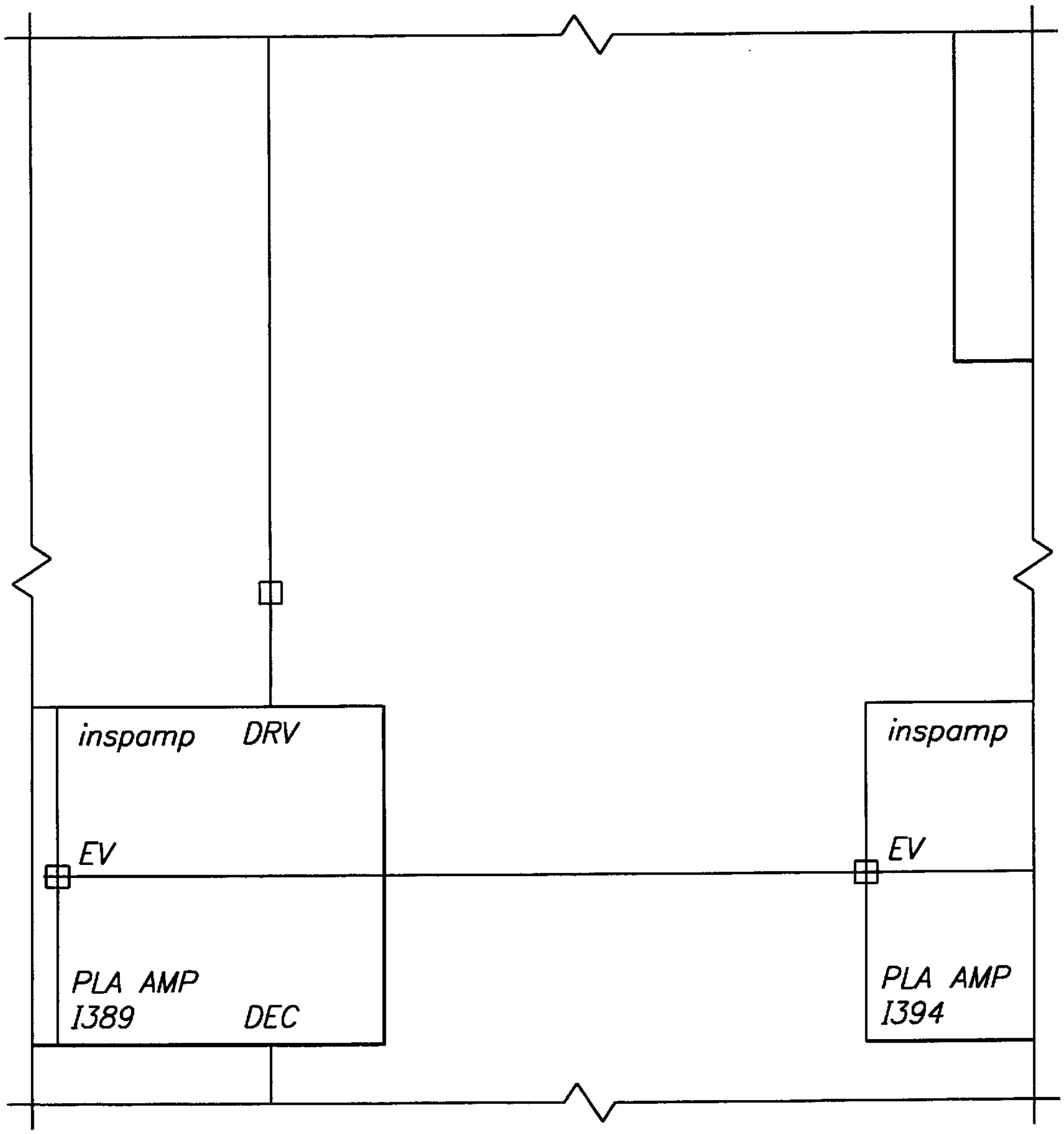
Fig 7.0601CF

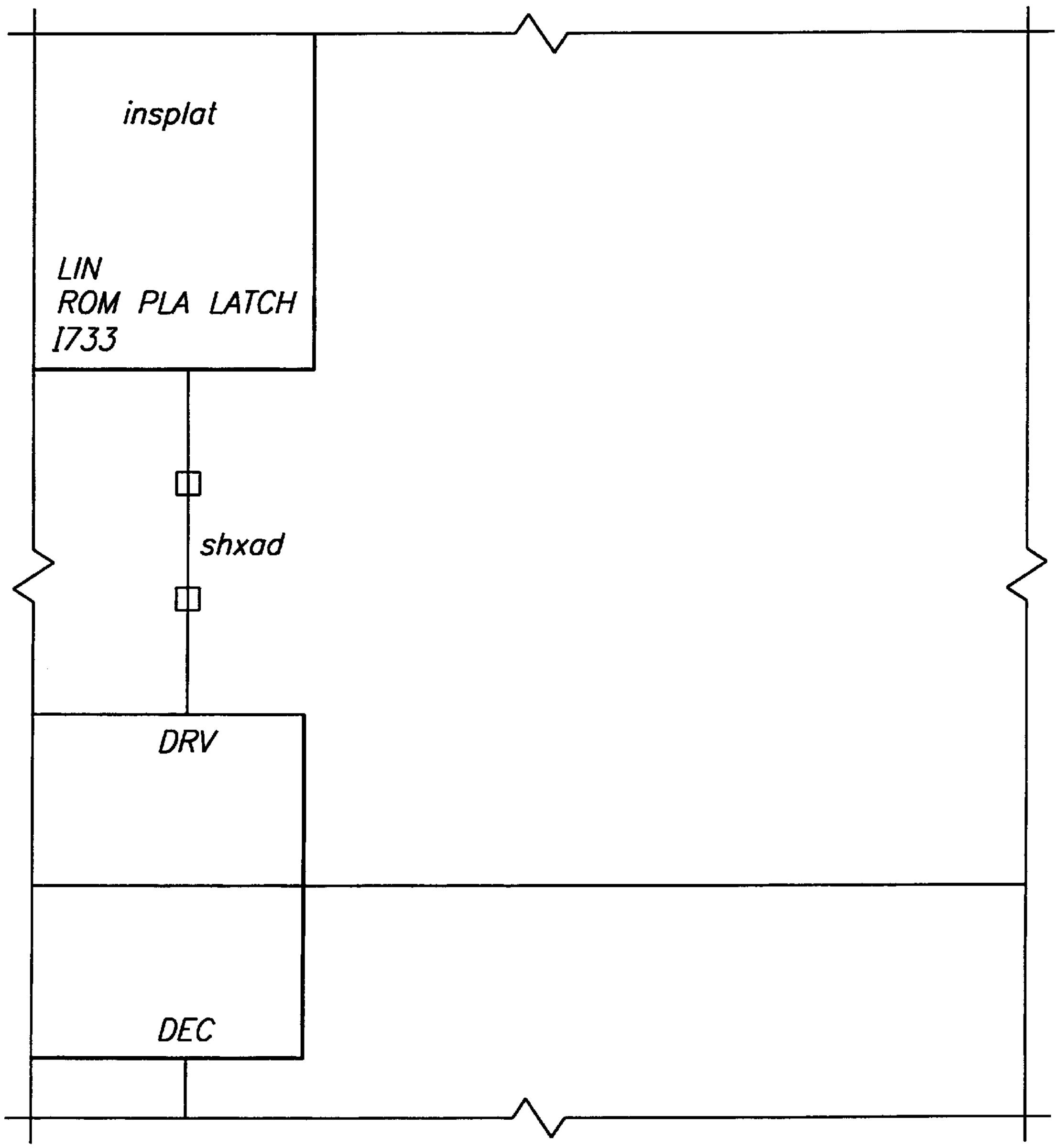
Fig 1.0601CG

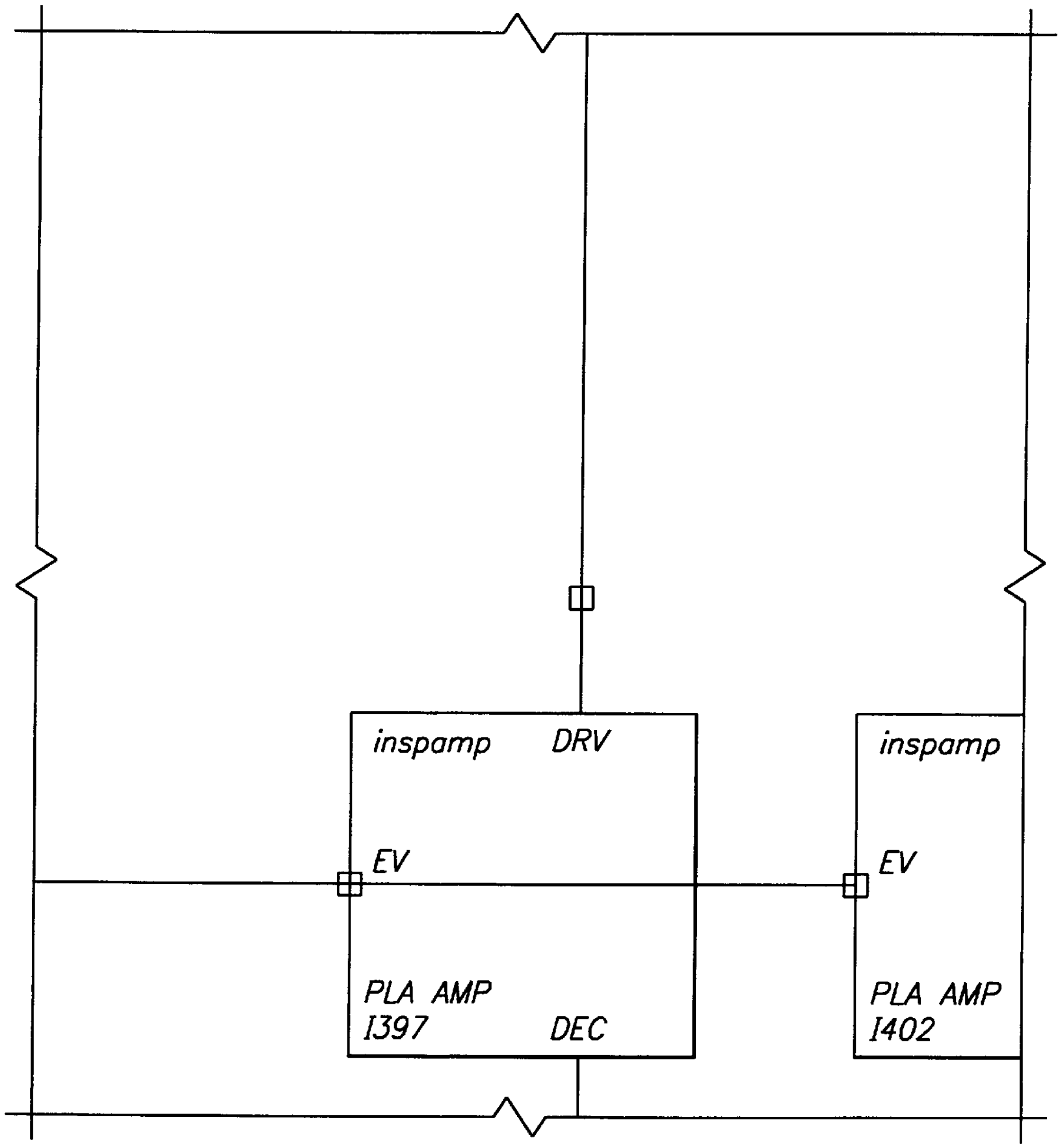
Fig 1.06G01CH

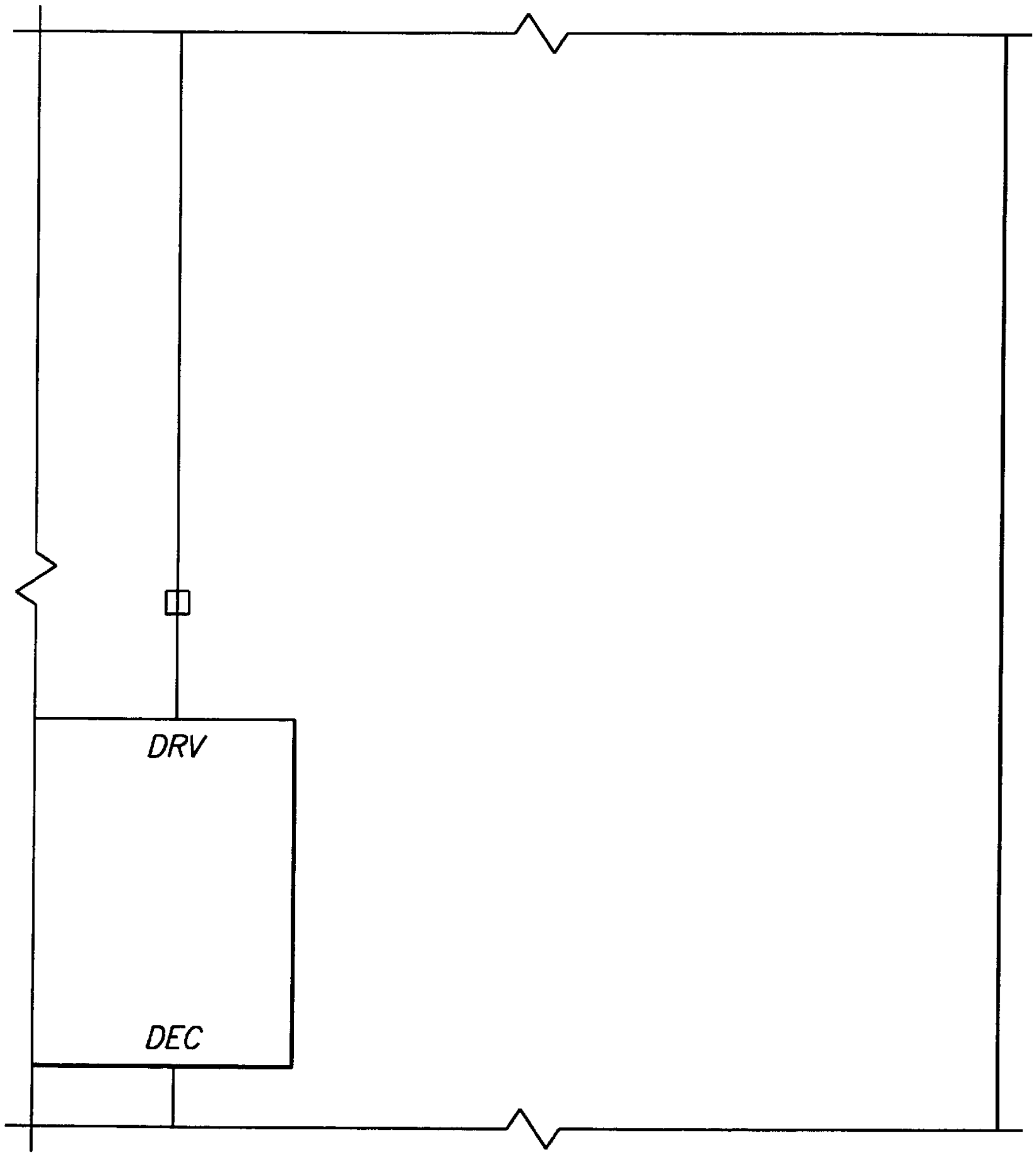
Fig 7.0601CI

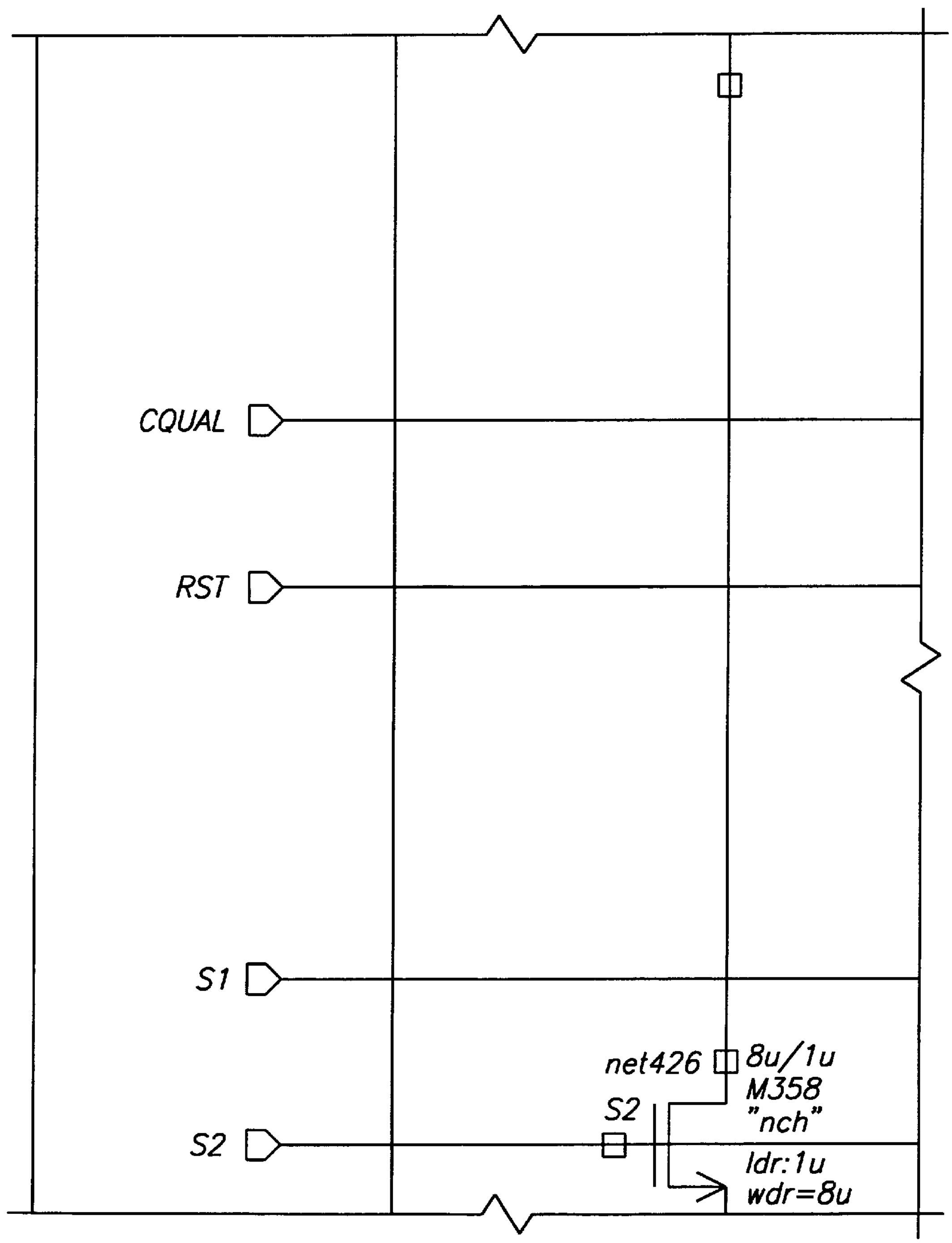
Fig 7.0601DA

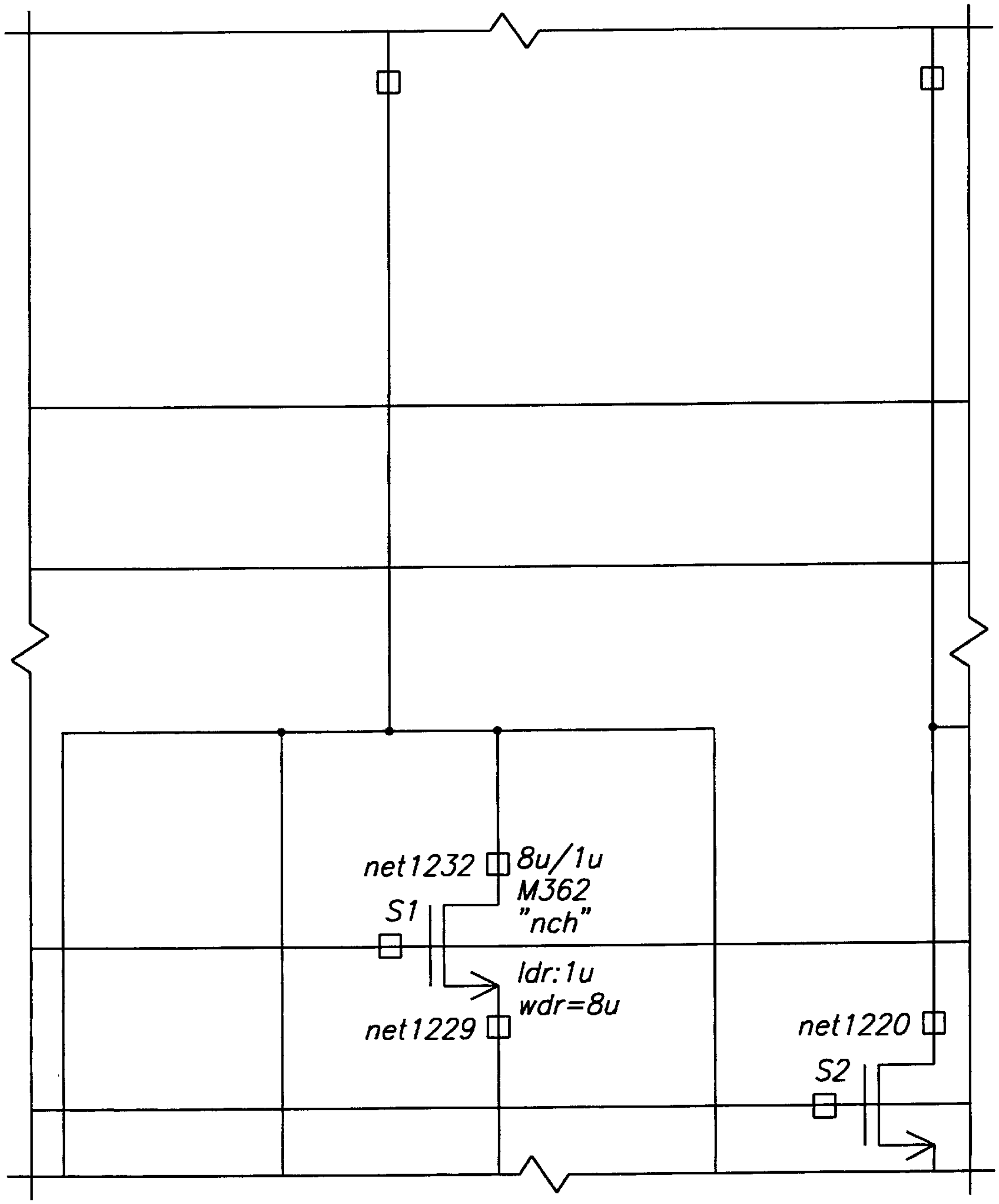
Fig 1.0601DB

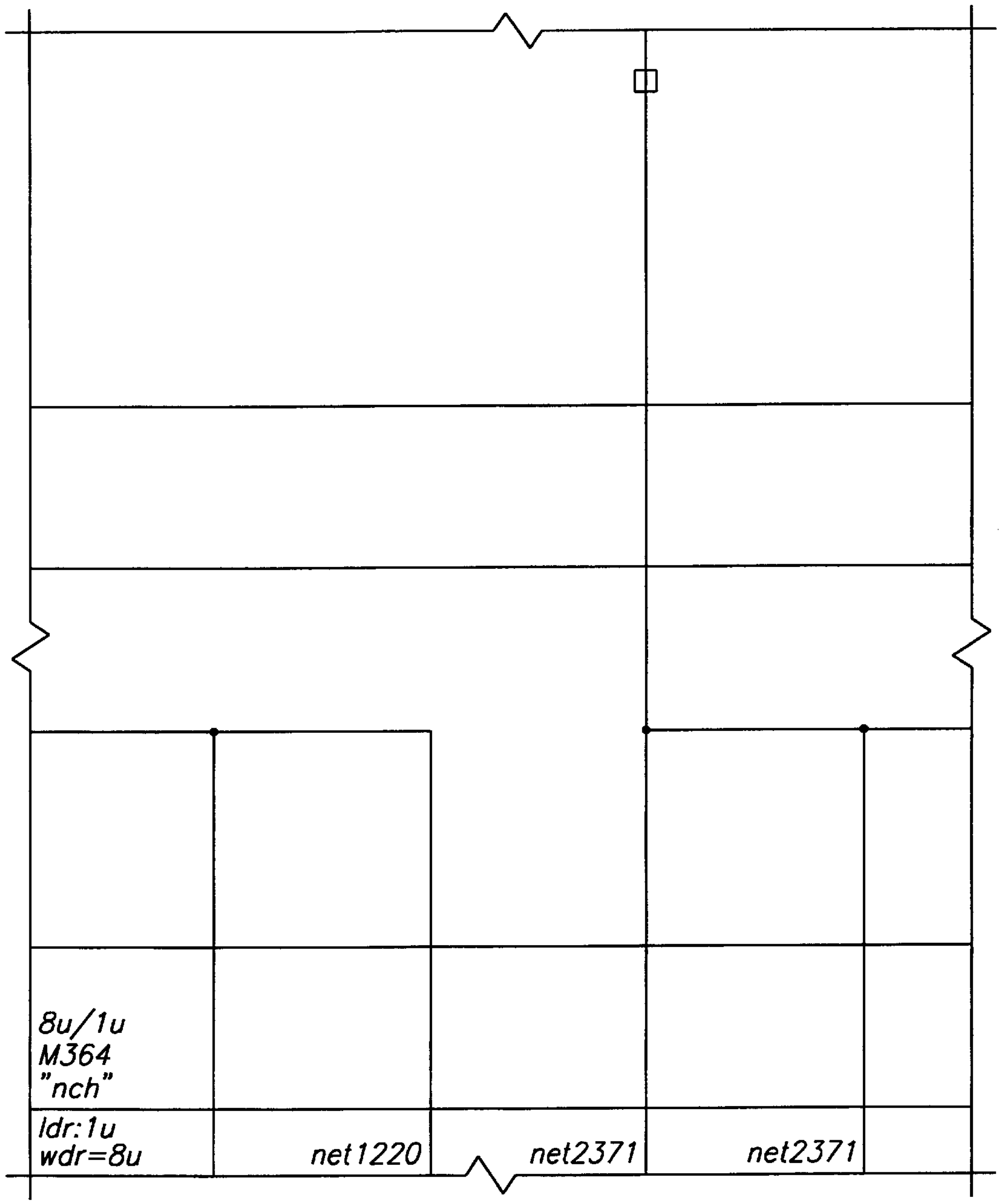
Fig 7.0601DC

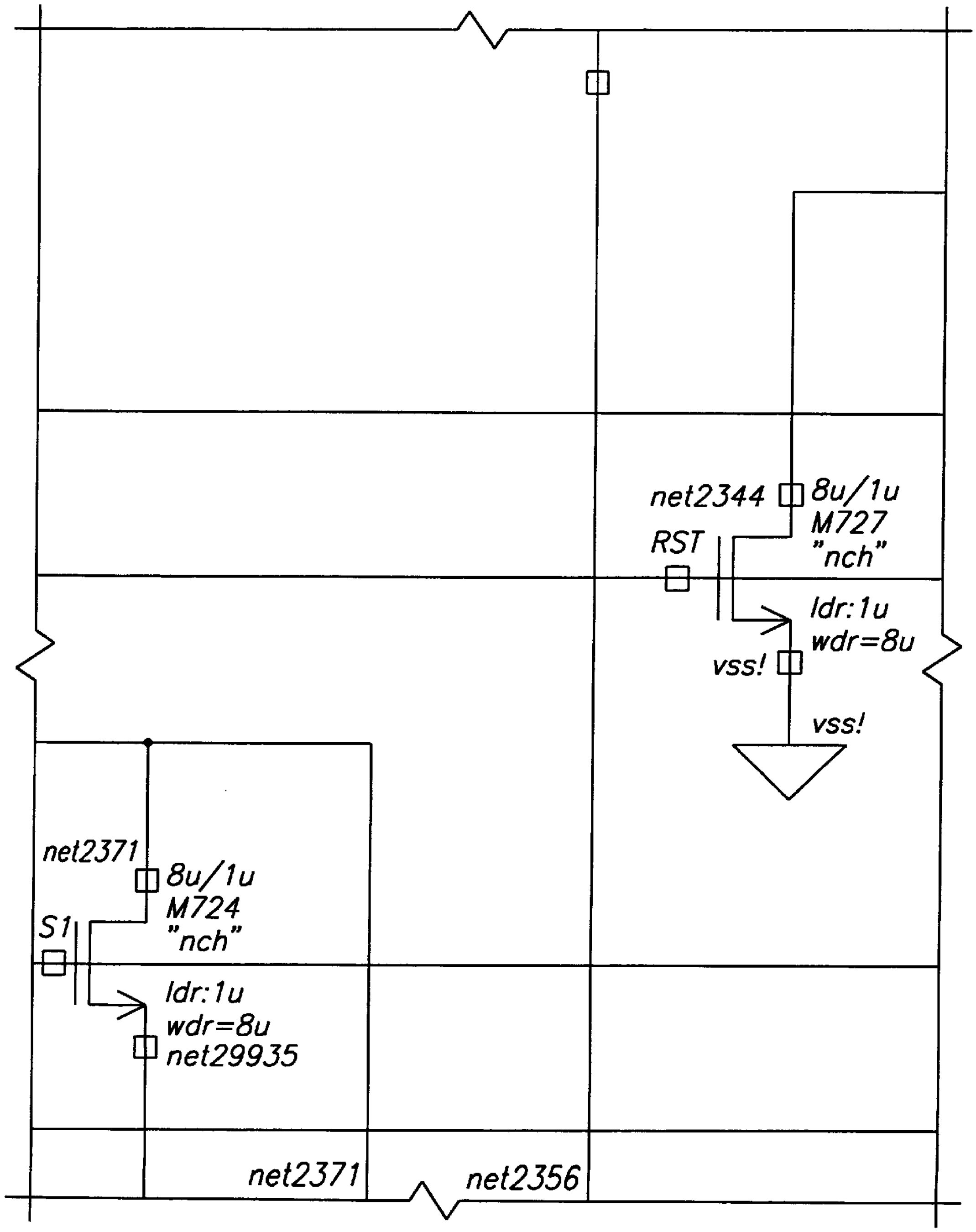
Fig. 7.0601DD

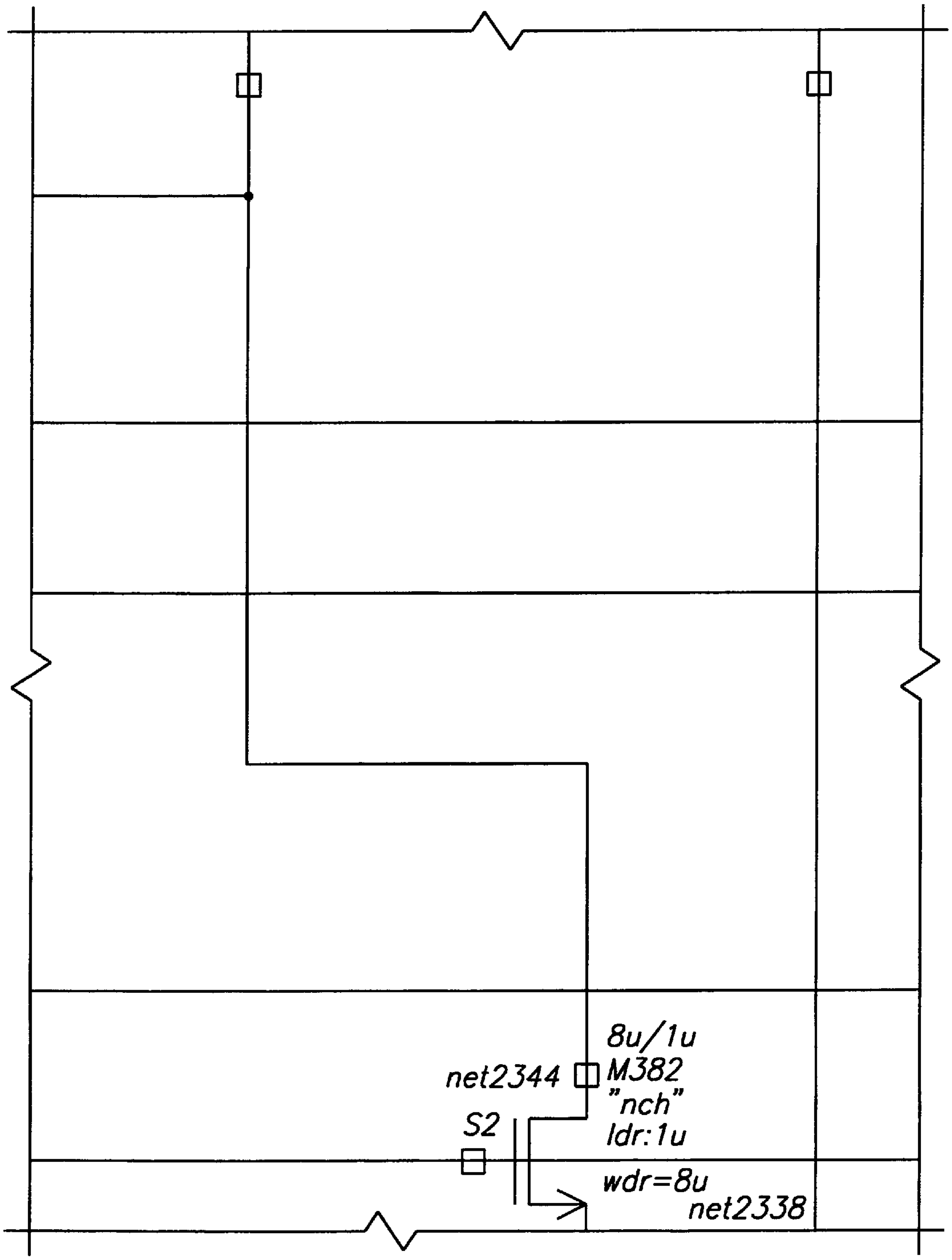
Fig. 7.0601DE

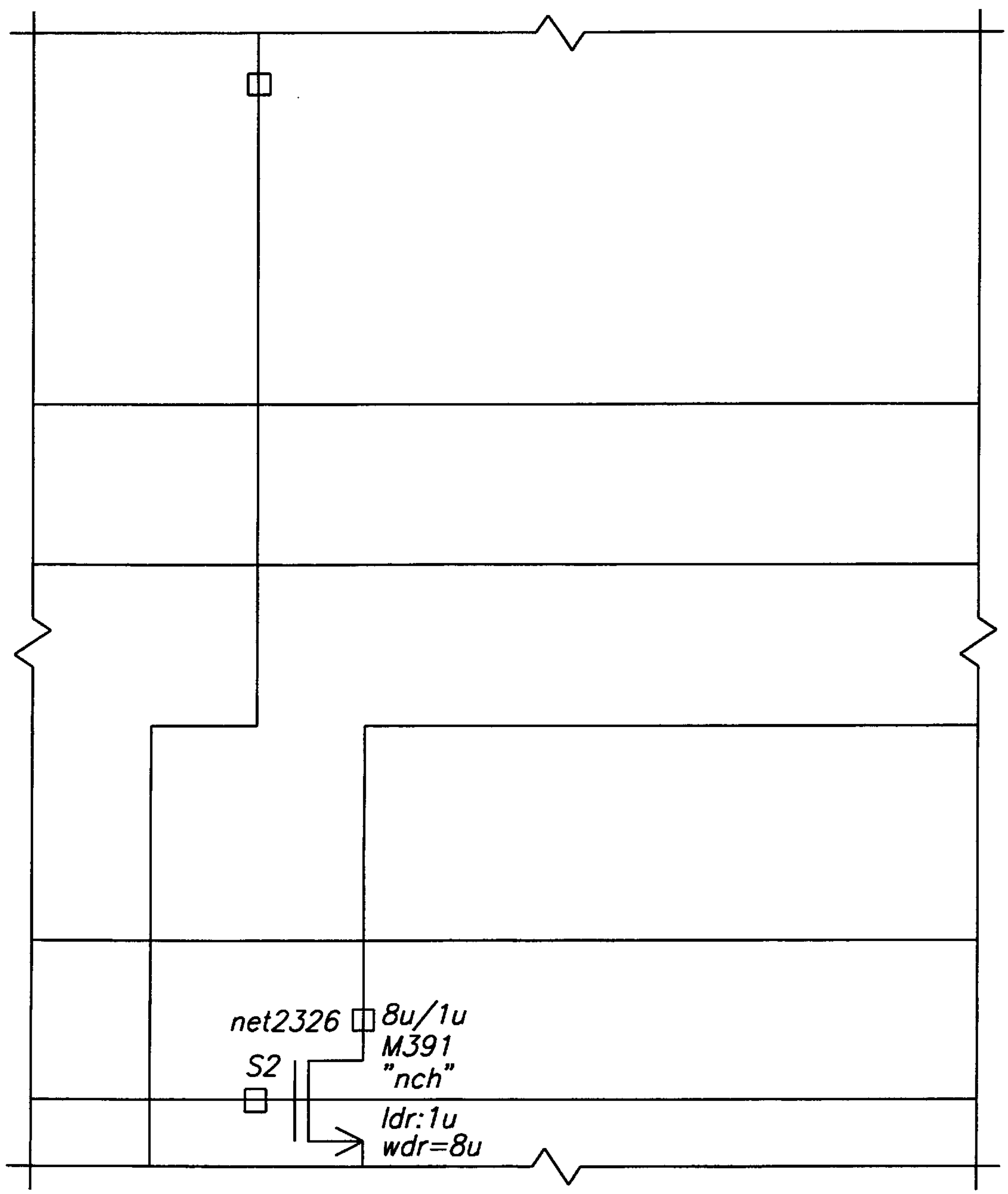
Fig 1.0601DF

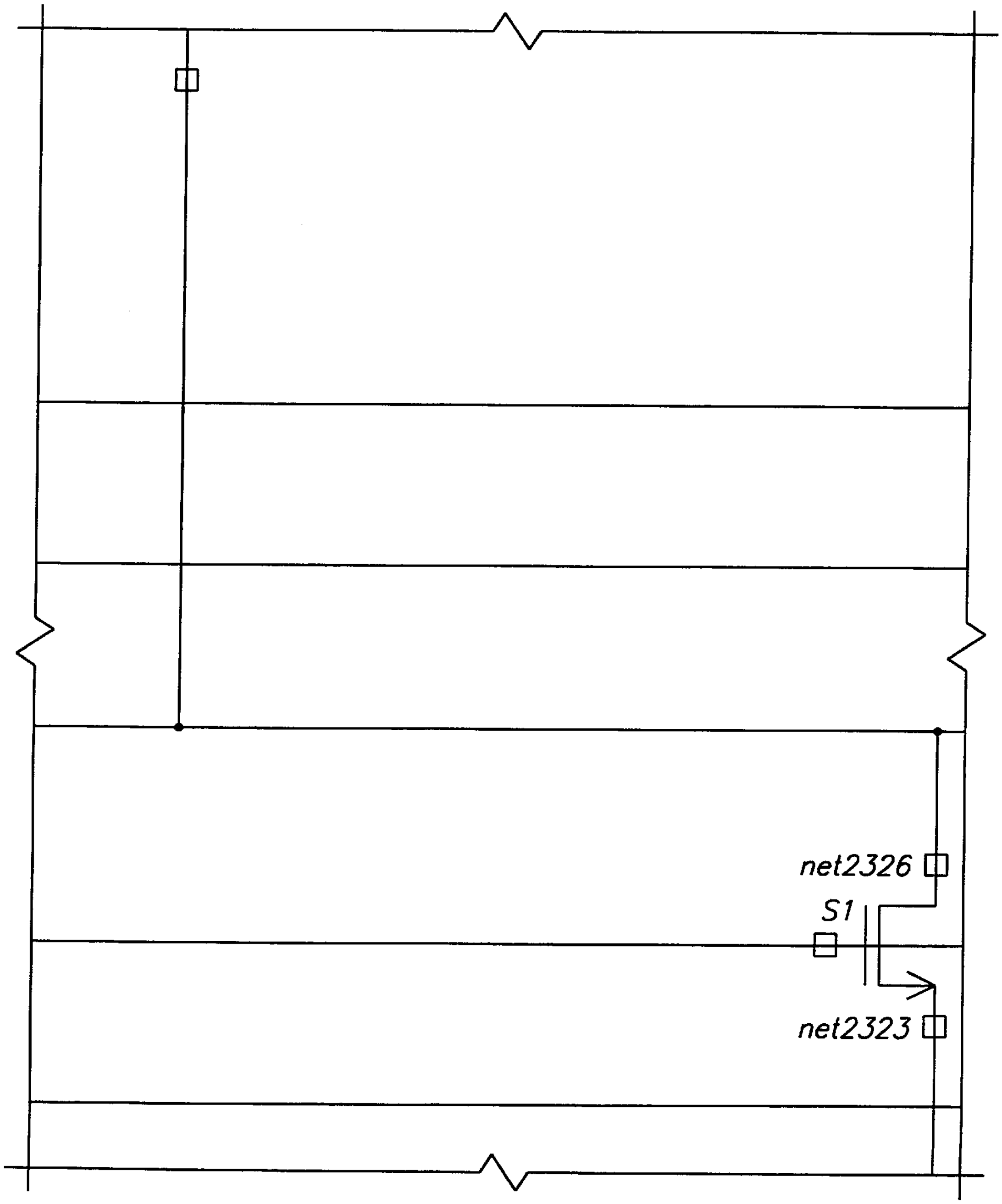
Fig 1.0601DG

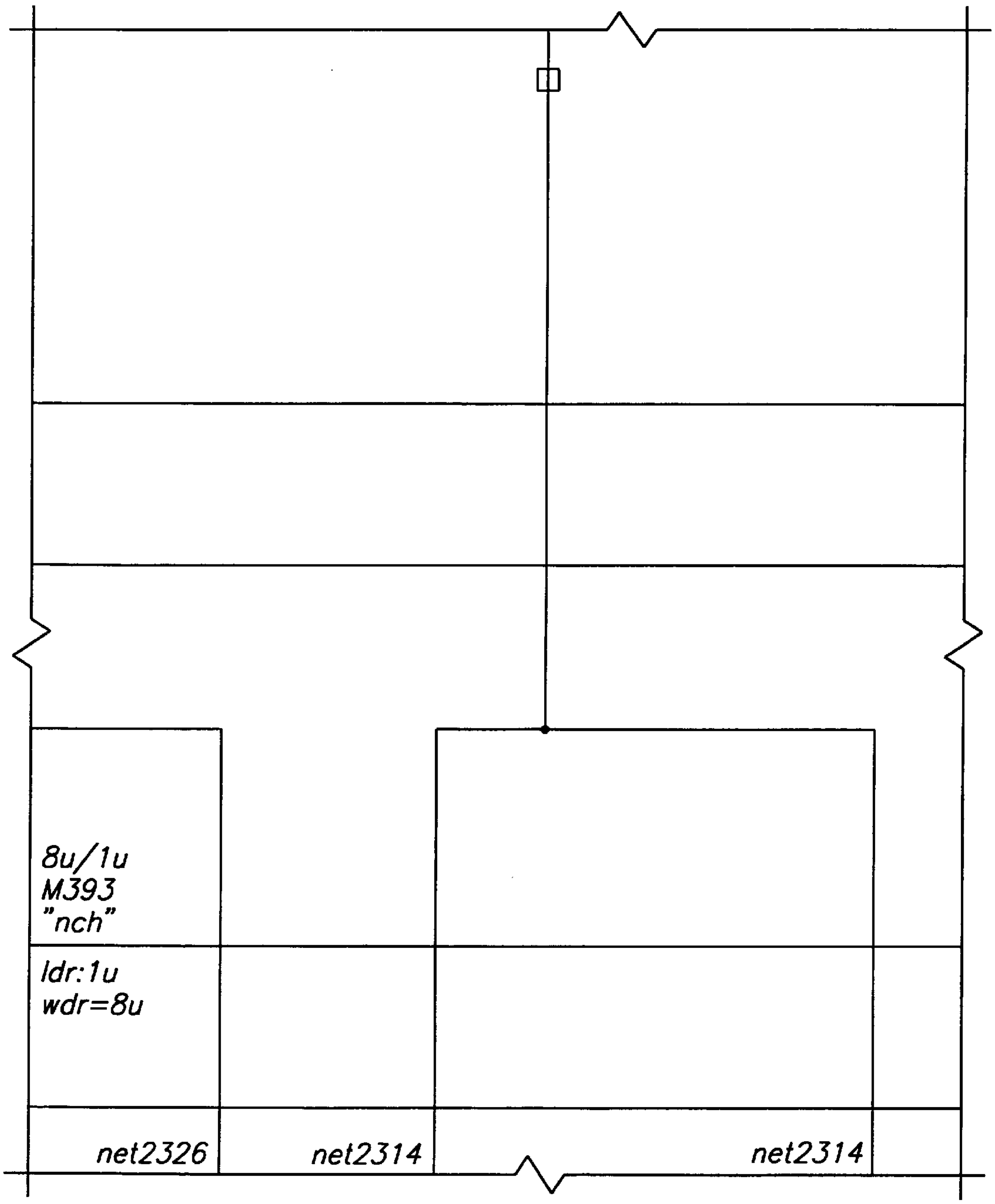
Fig 7.06012DH

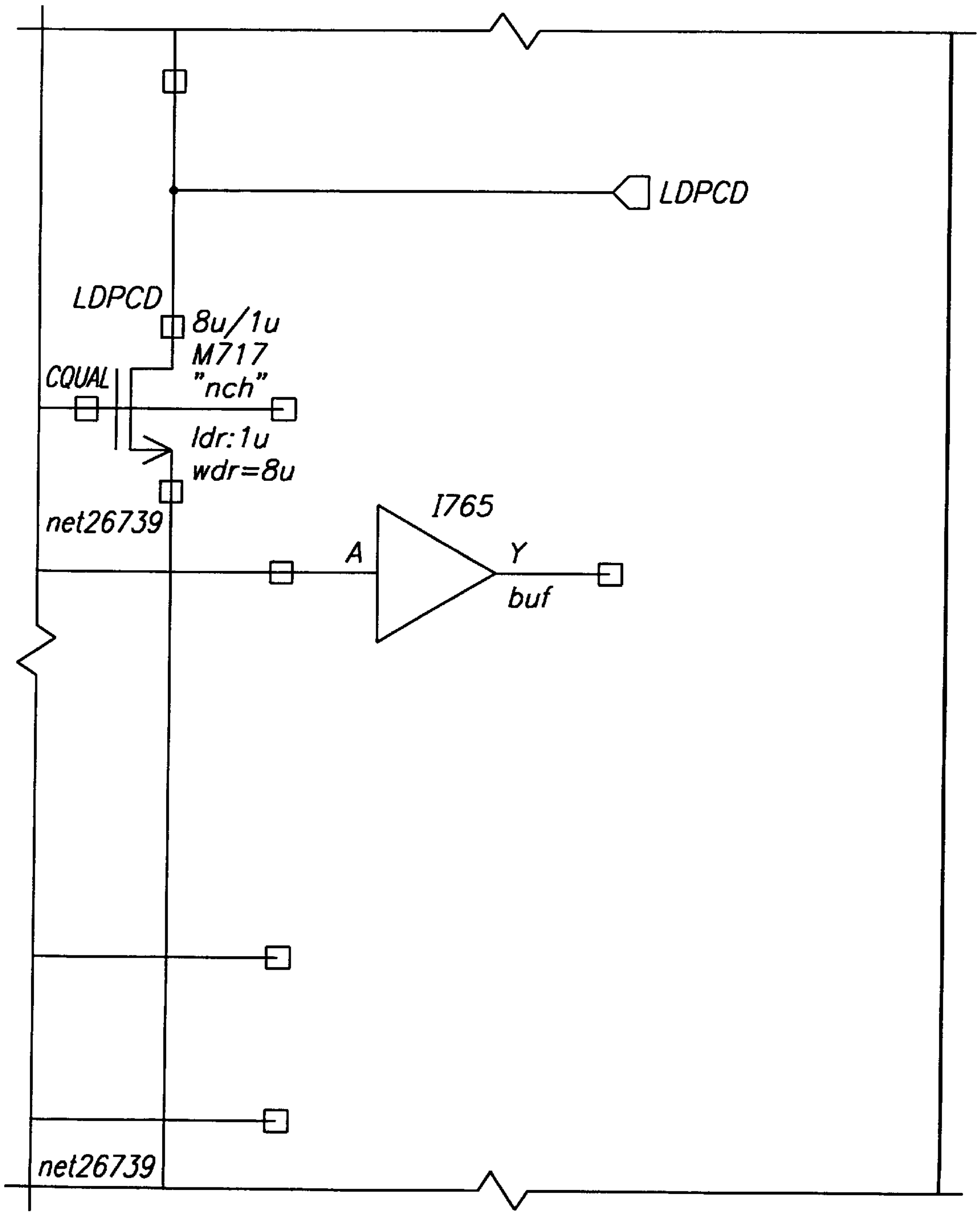
Fig 1.0601DI

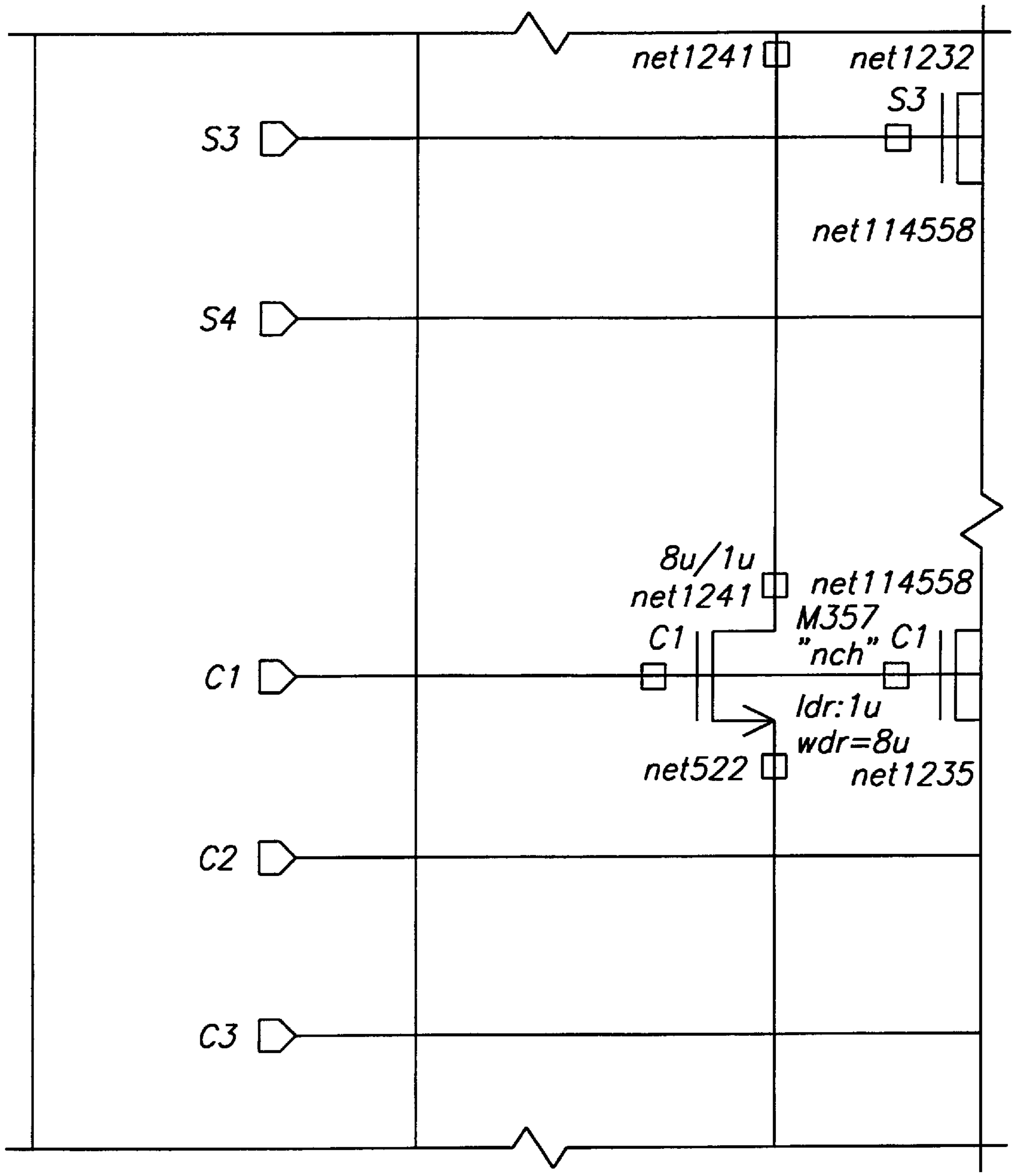
Fig 7.06O1EA

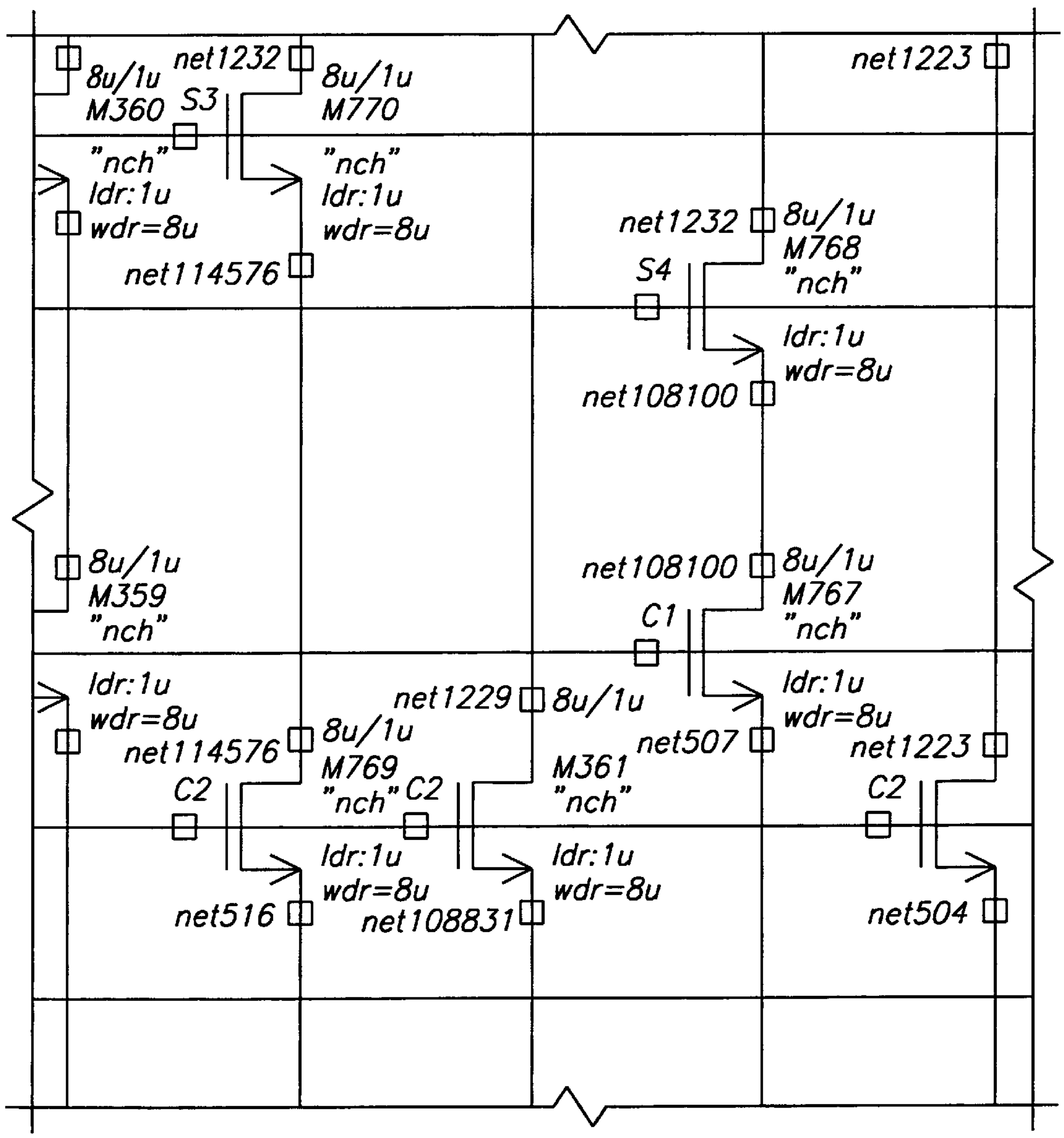
FIG 7.06O1EB

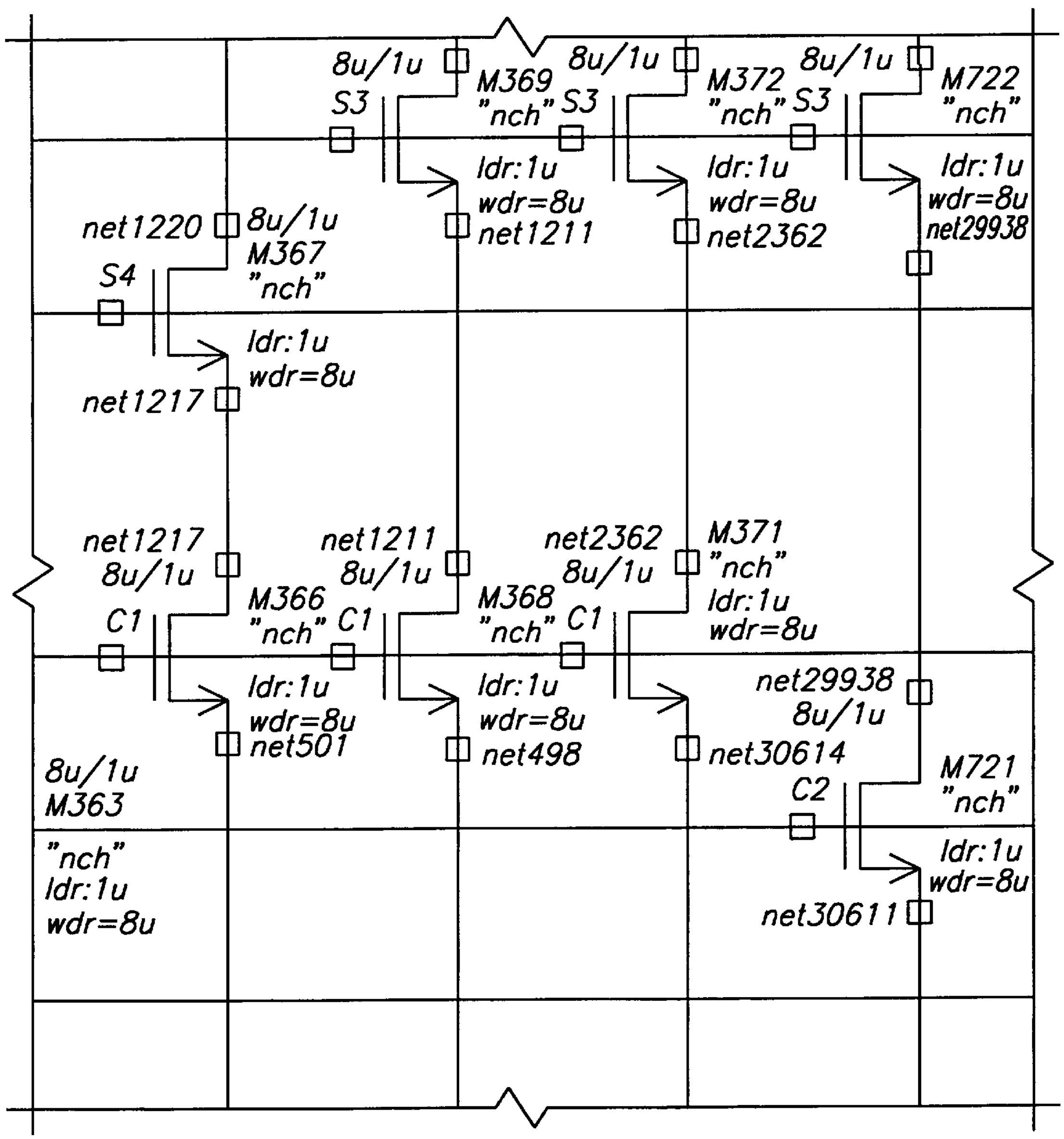
Fig 7.06D1EC

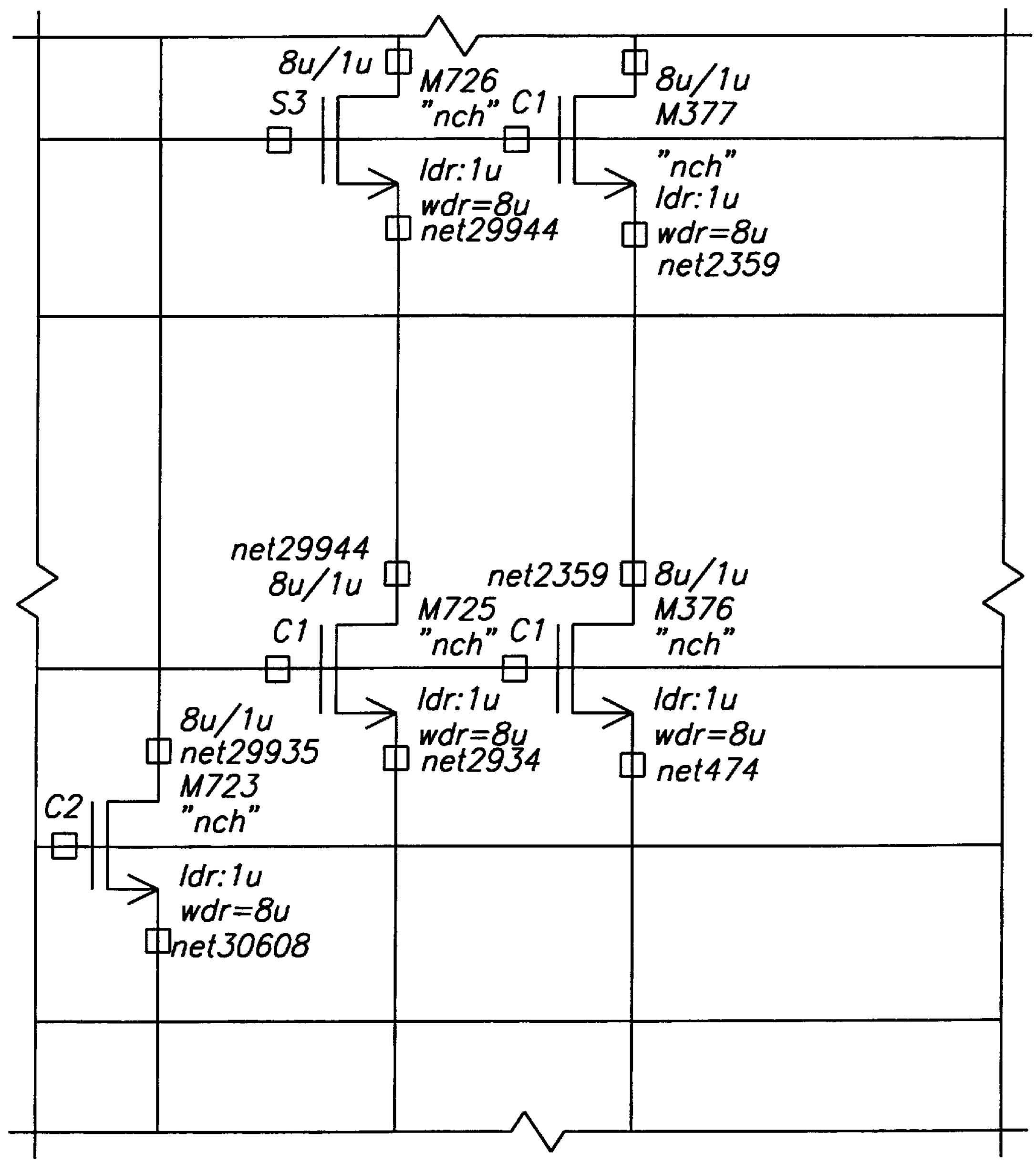
FIG. 7.0601ED

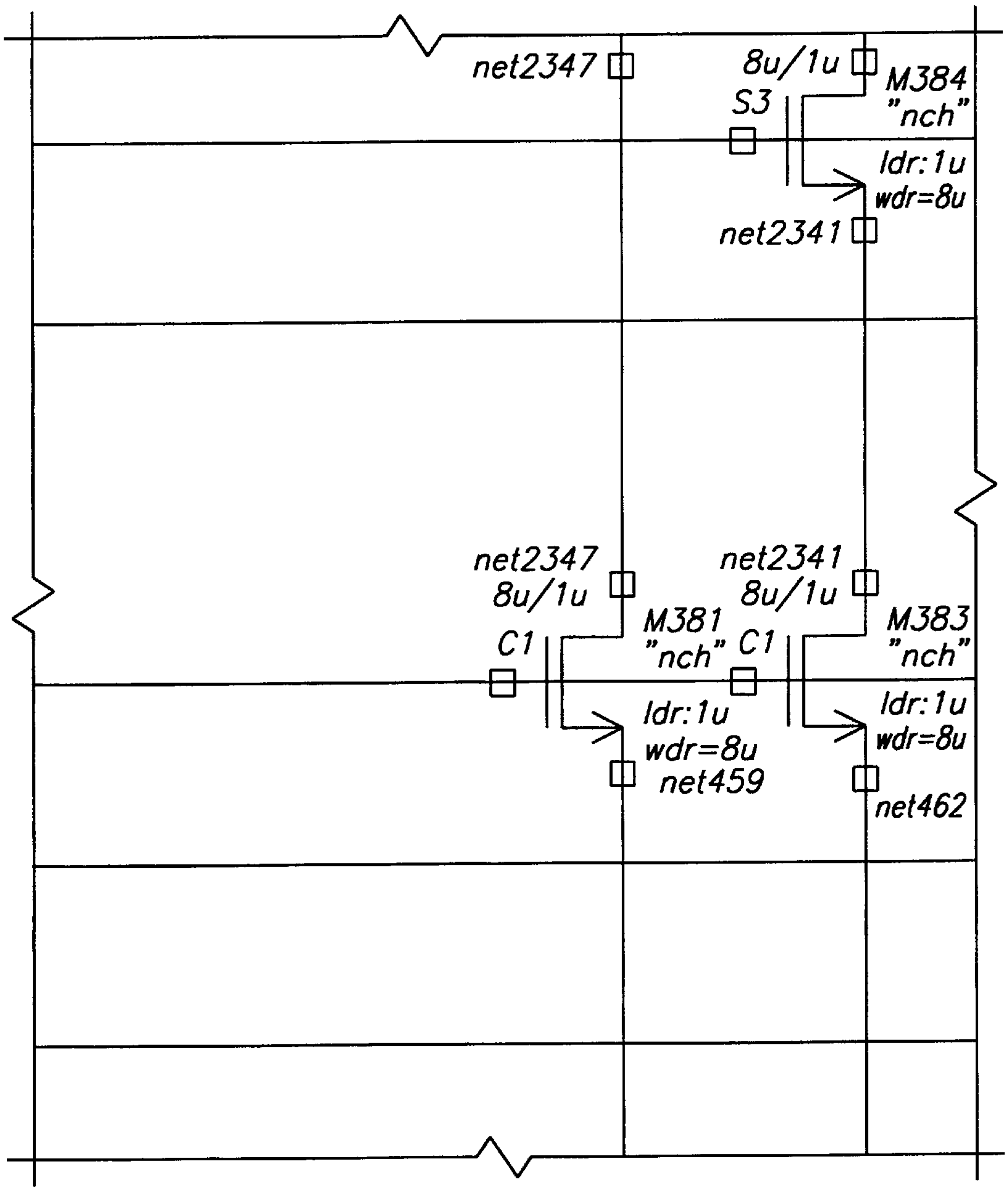
Fig 1.0601EE

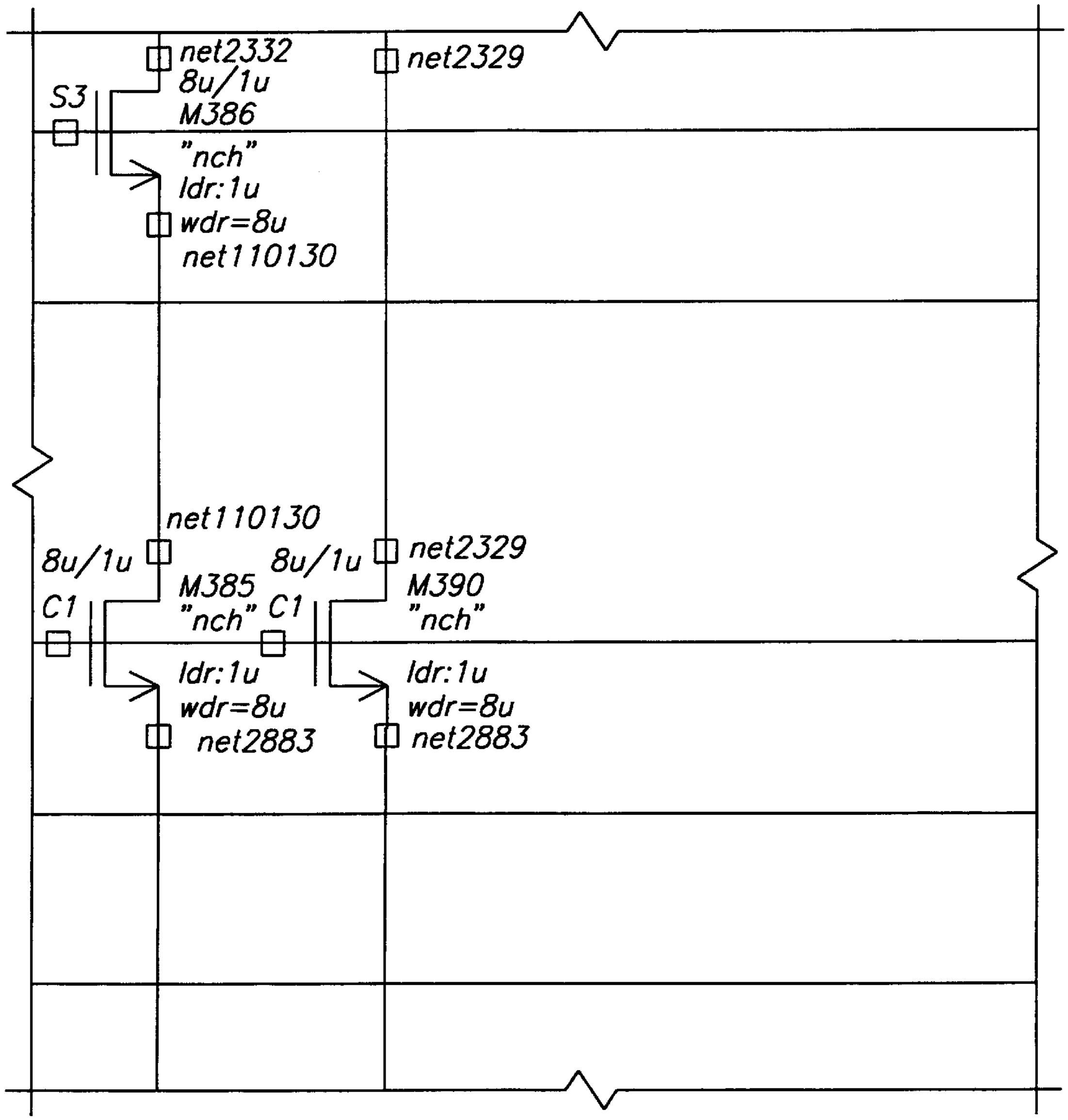
FIG 7.0601EF

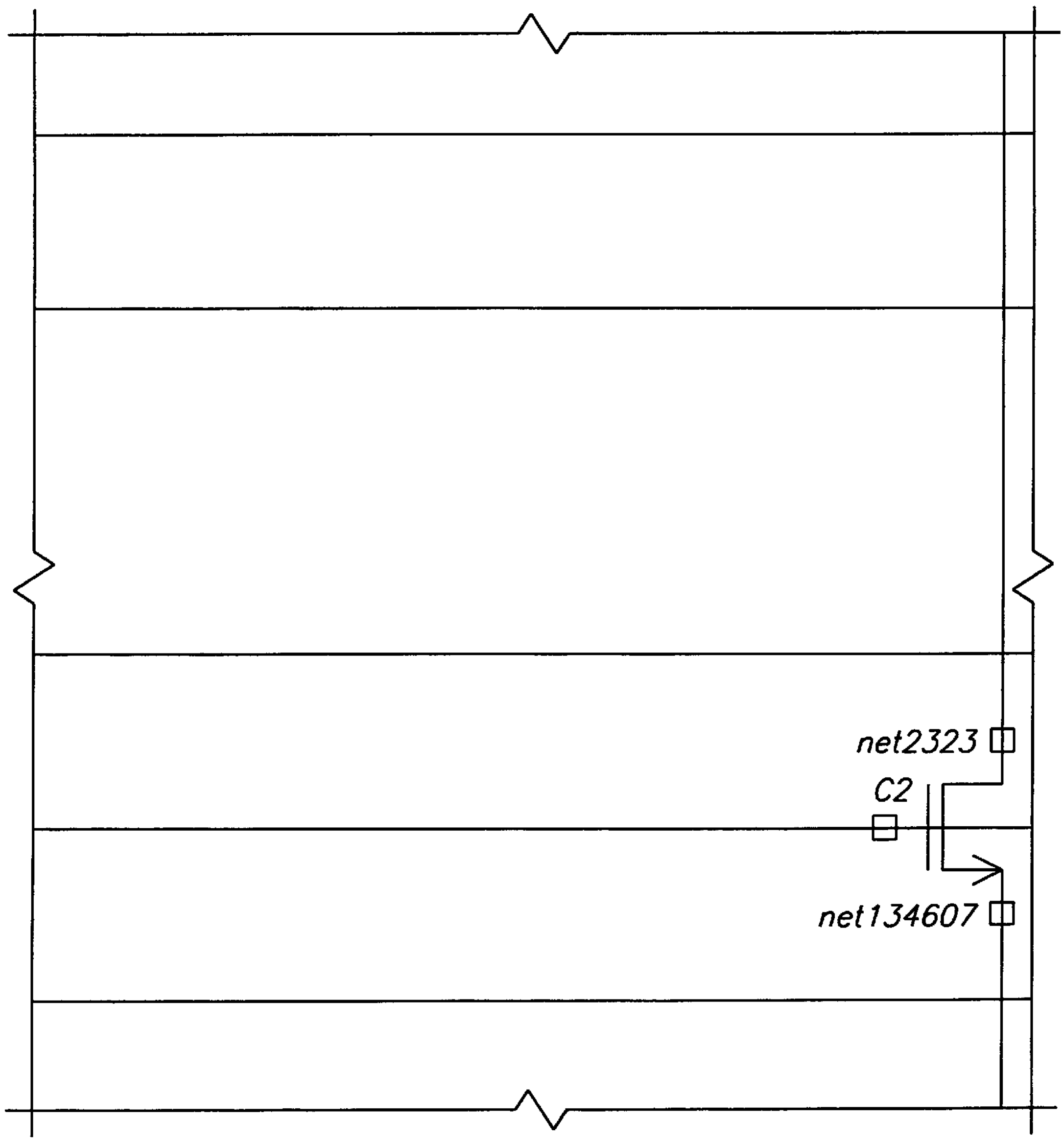
Fig 7.0601EG

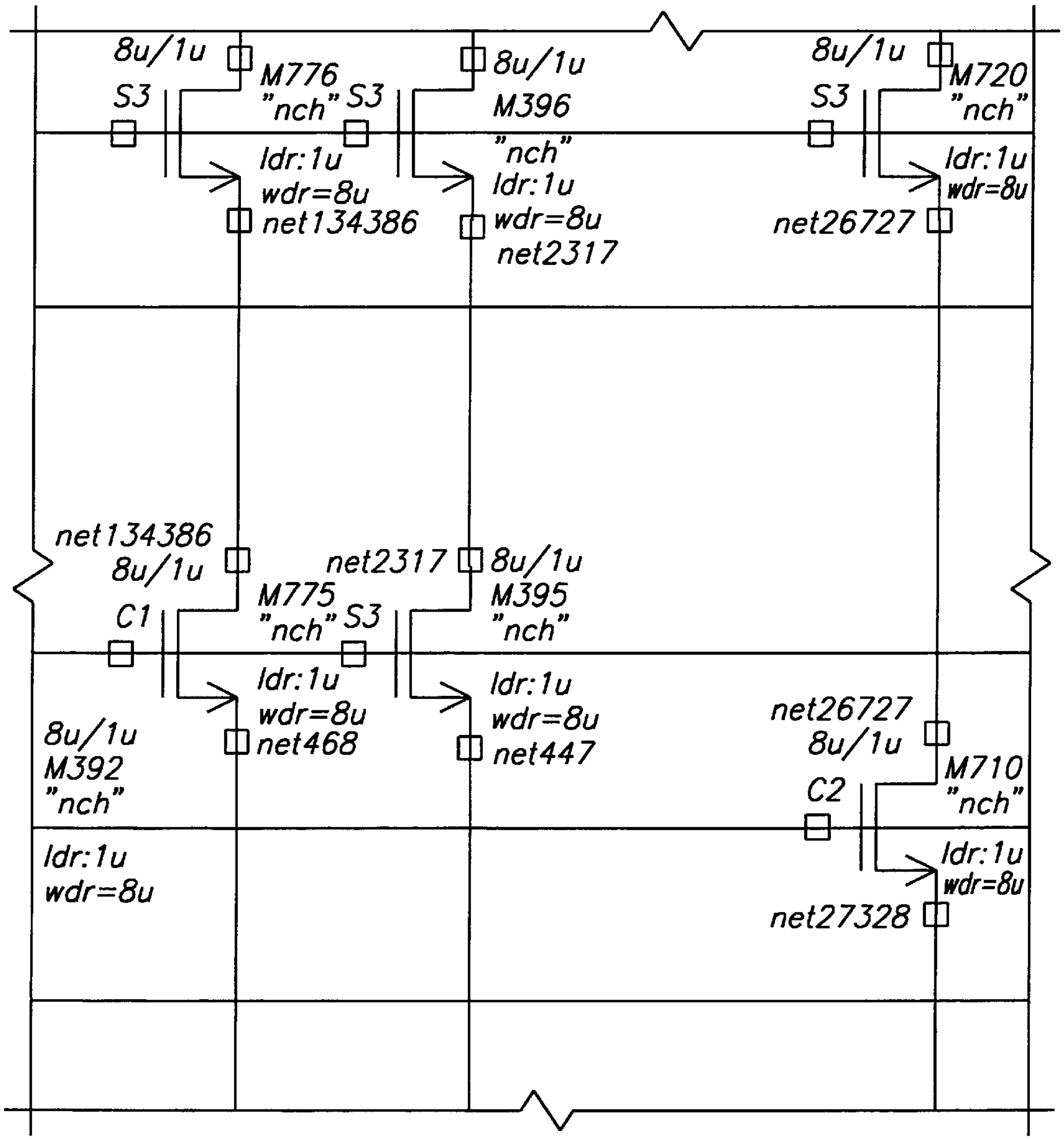
Fig 1.06D1EH

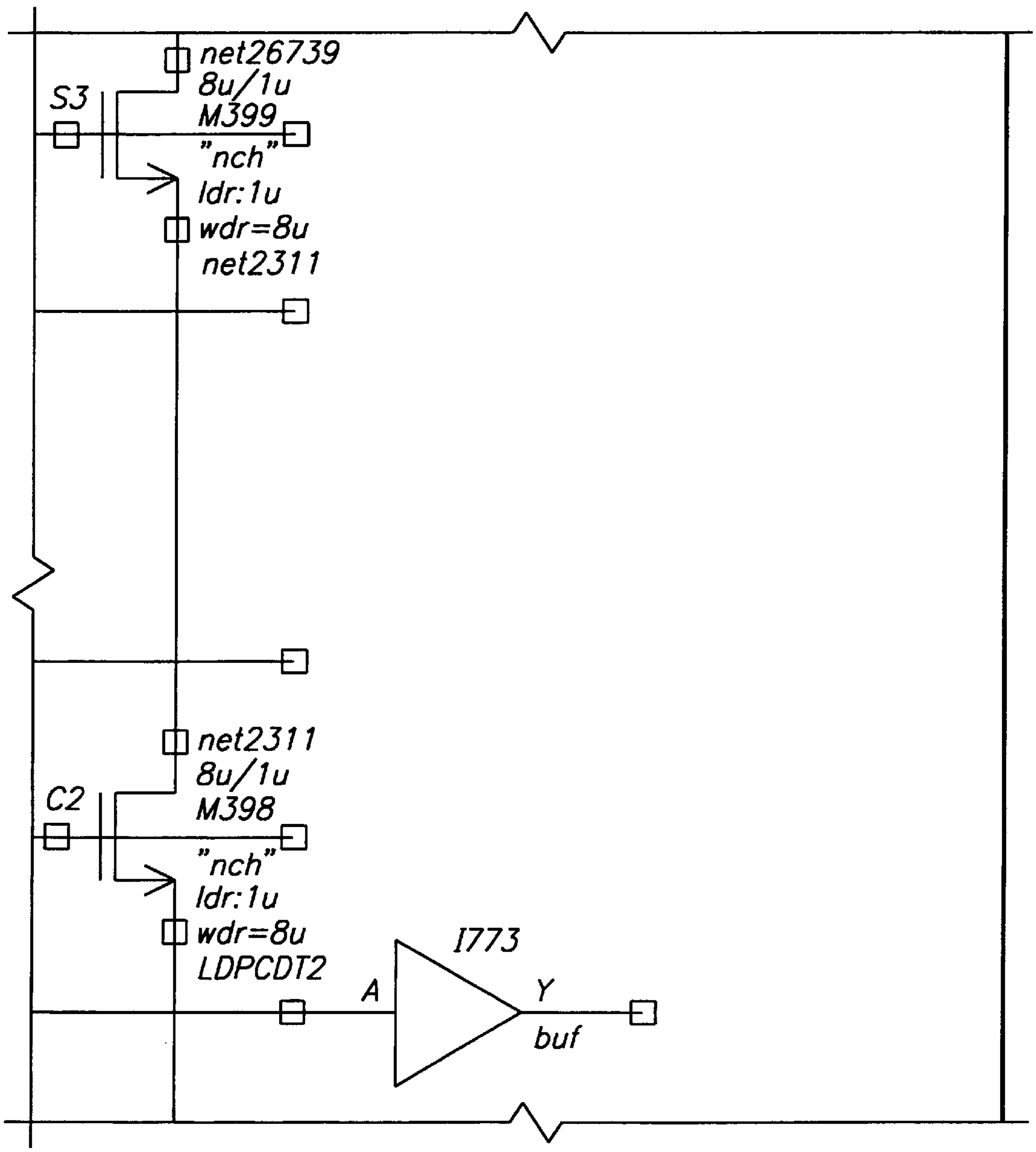
Fig 7.0601E1

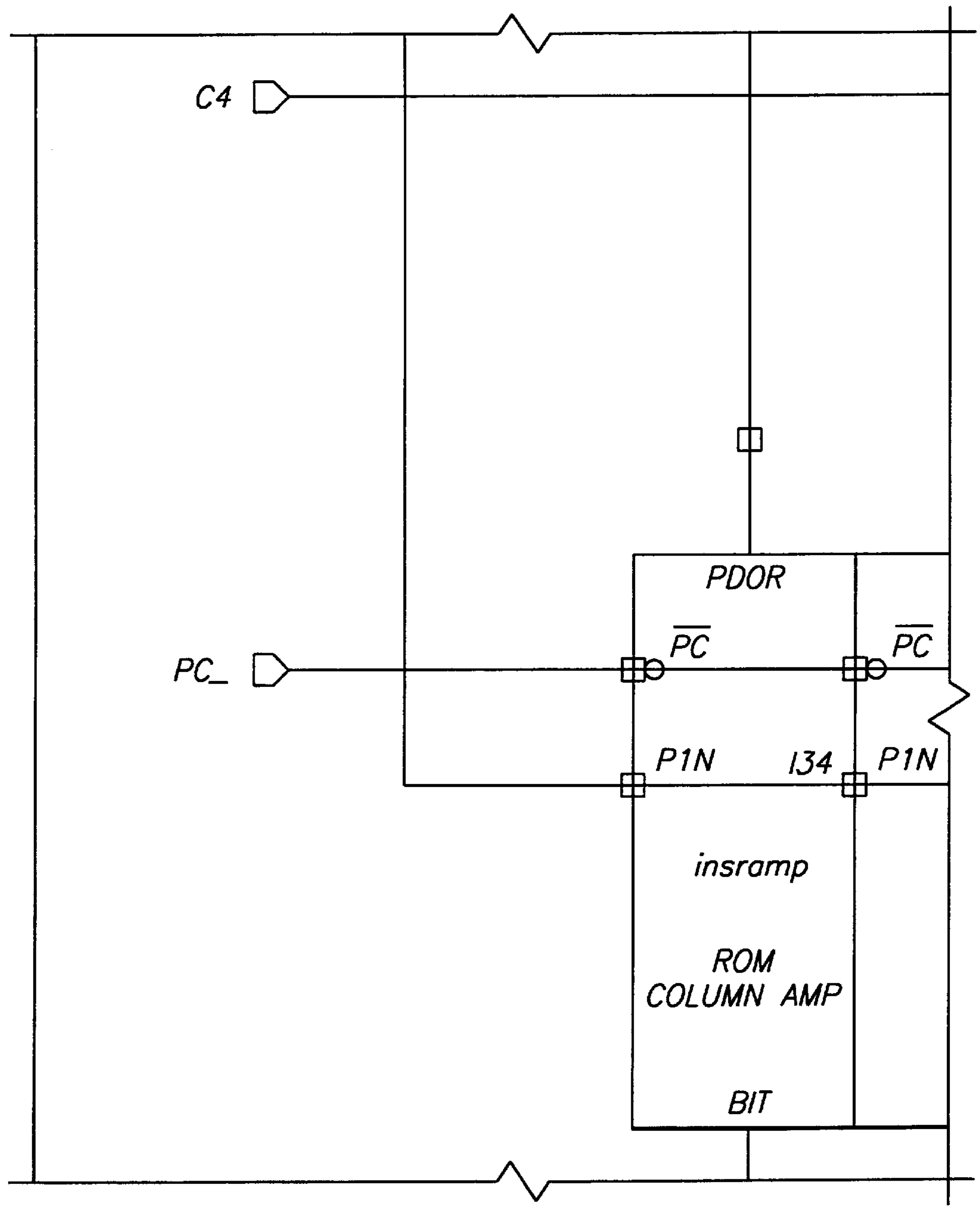
FIG. 7.0601FA

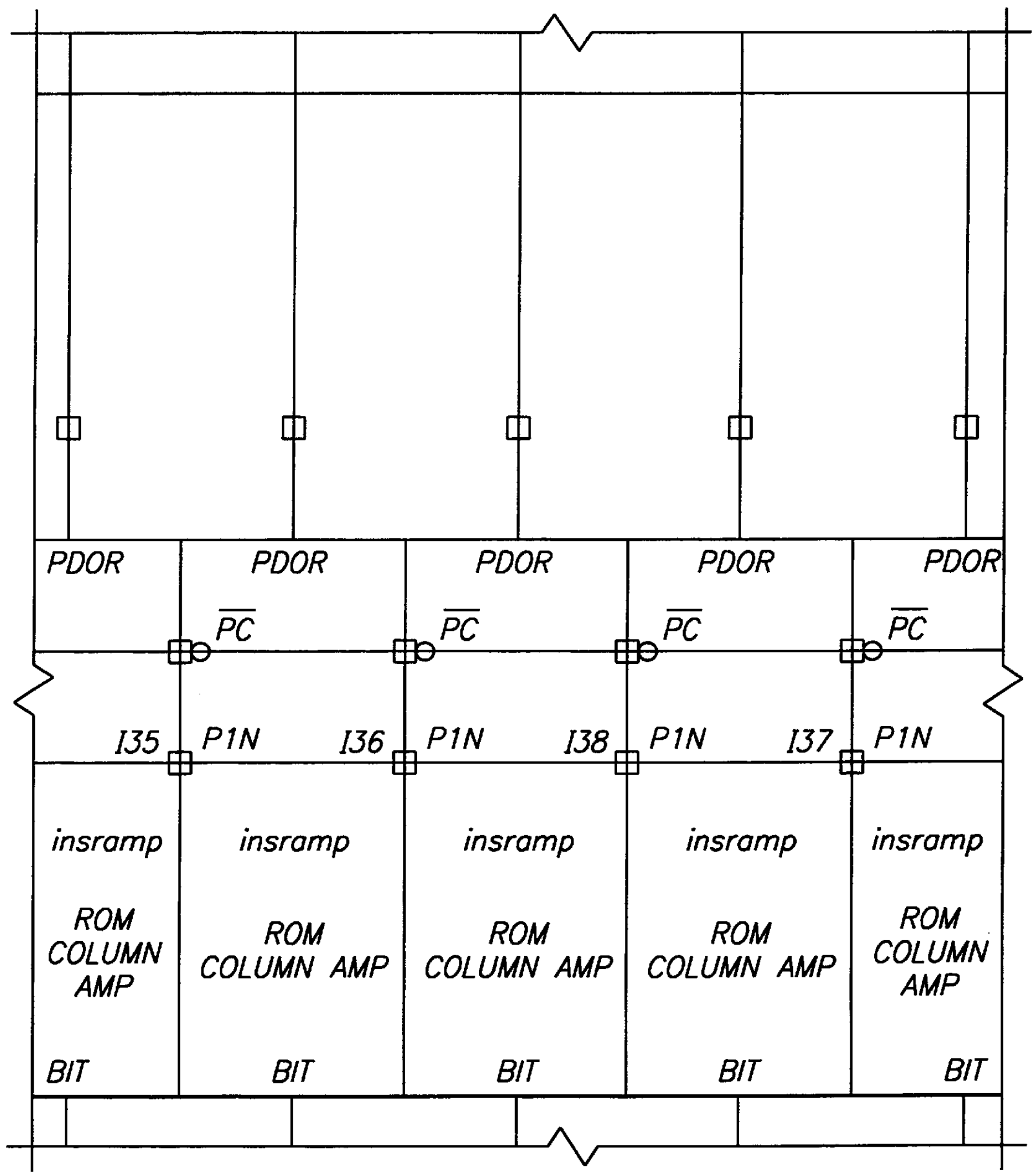
Fig 7.0601FB

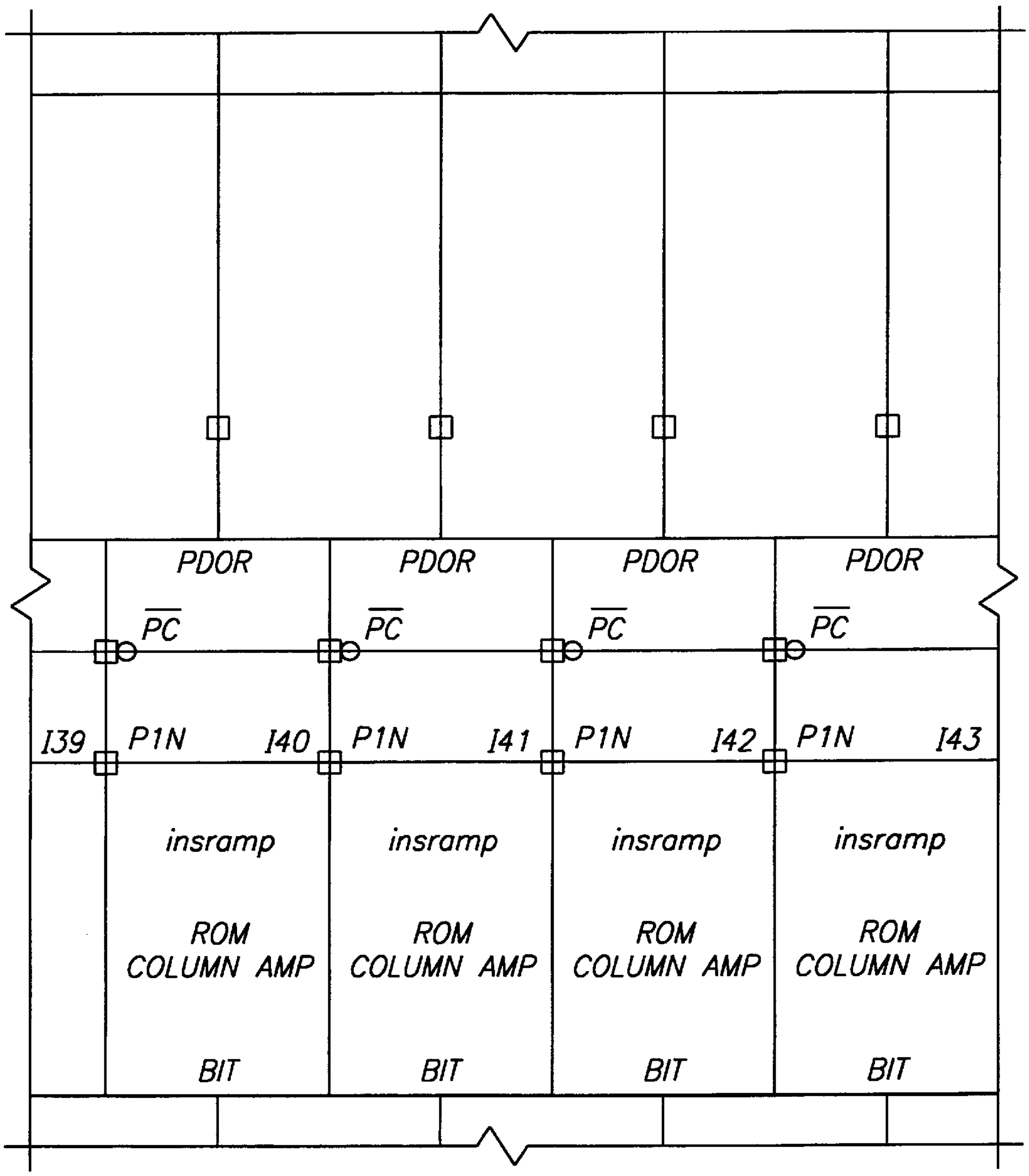
Fig 1.0601FC

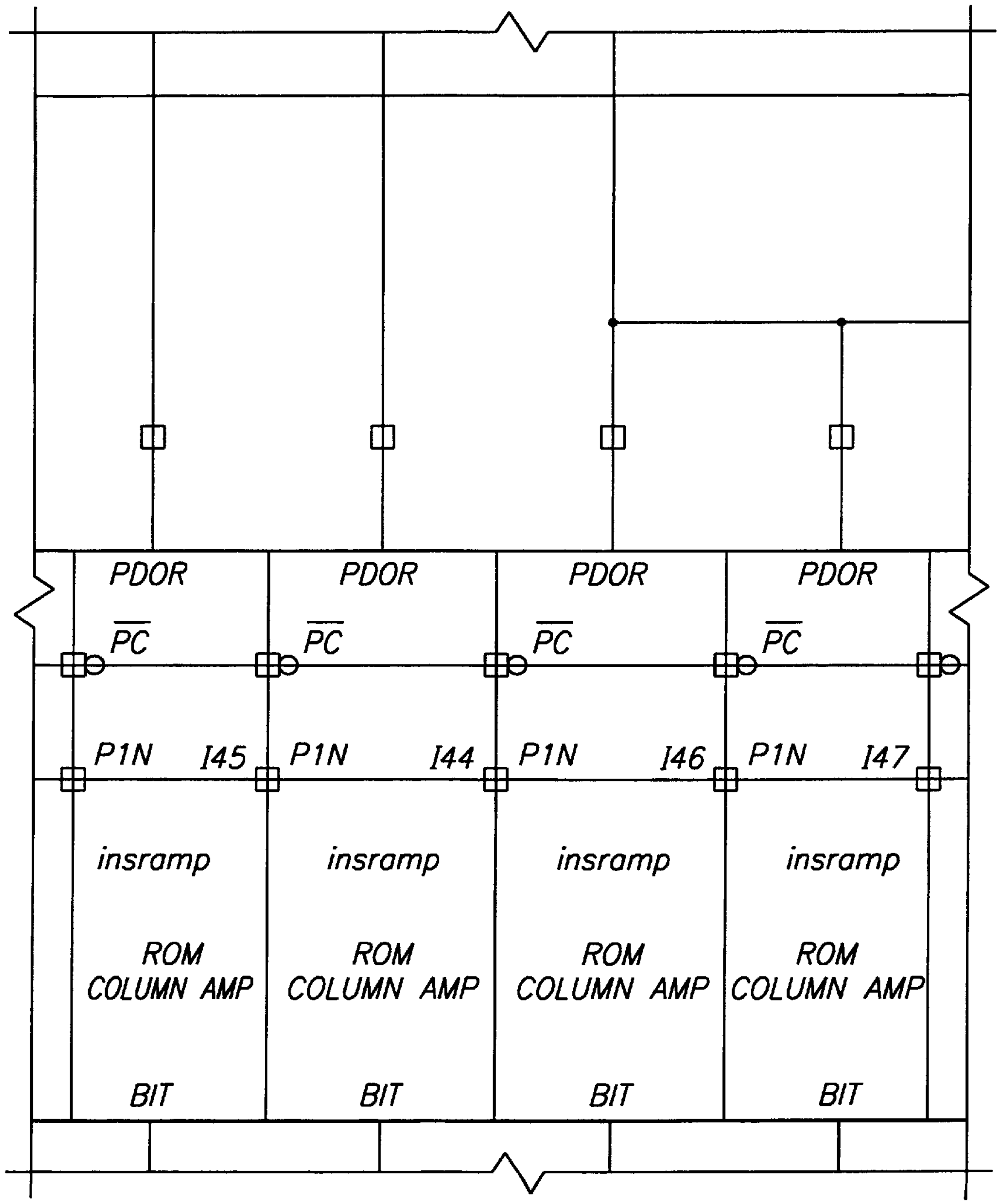
Fig. 1.0601FD

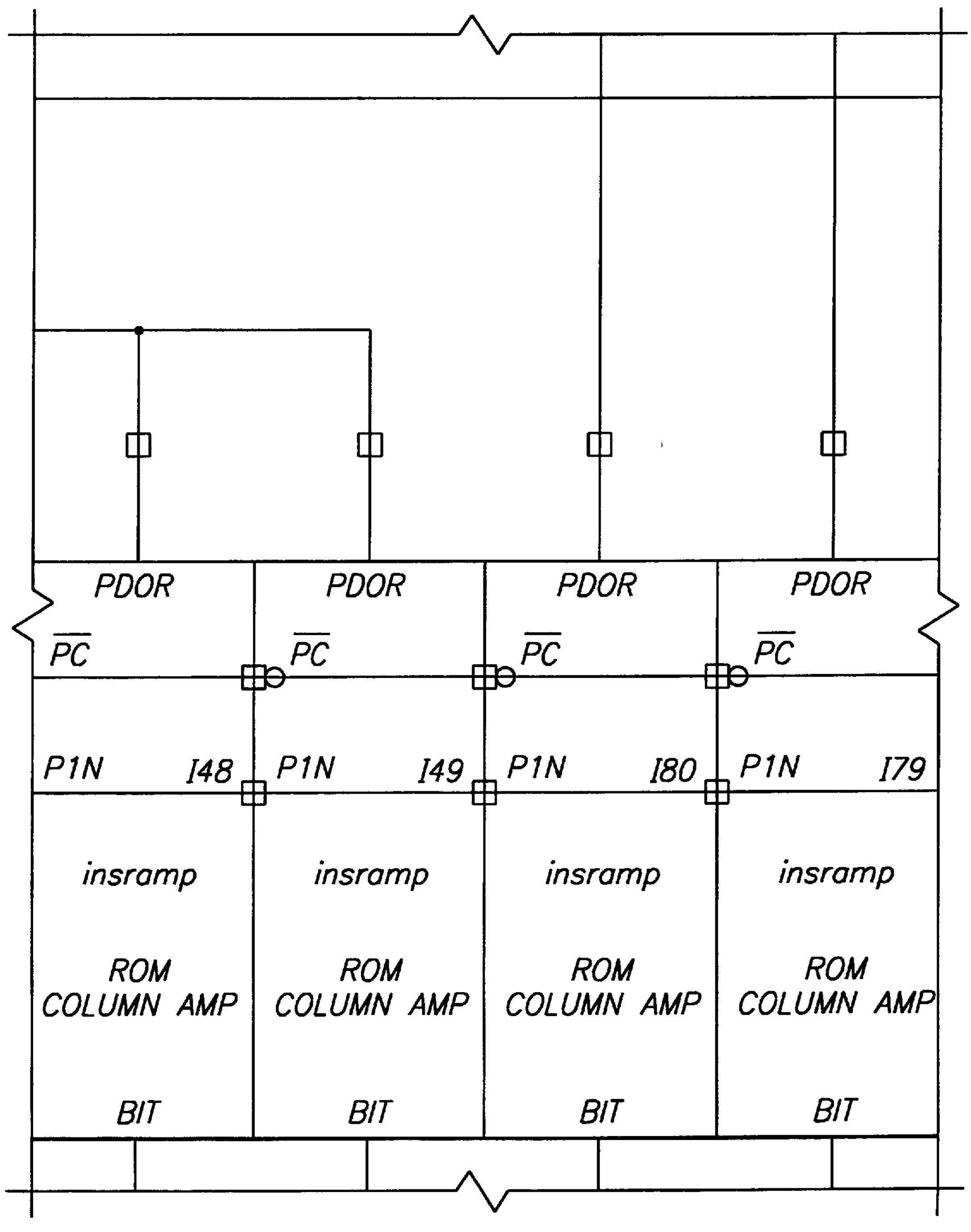
Fig 7.0601FE

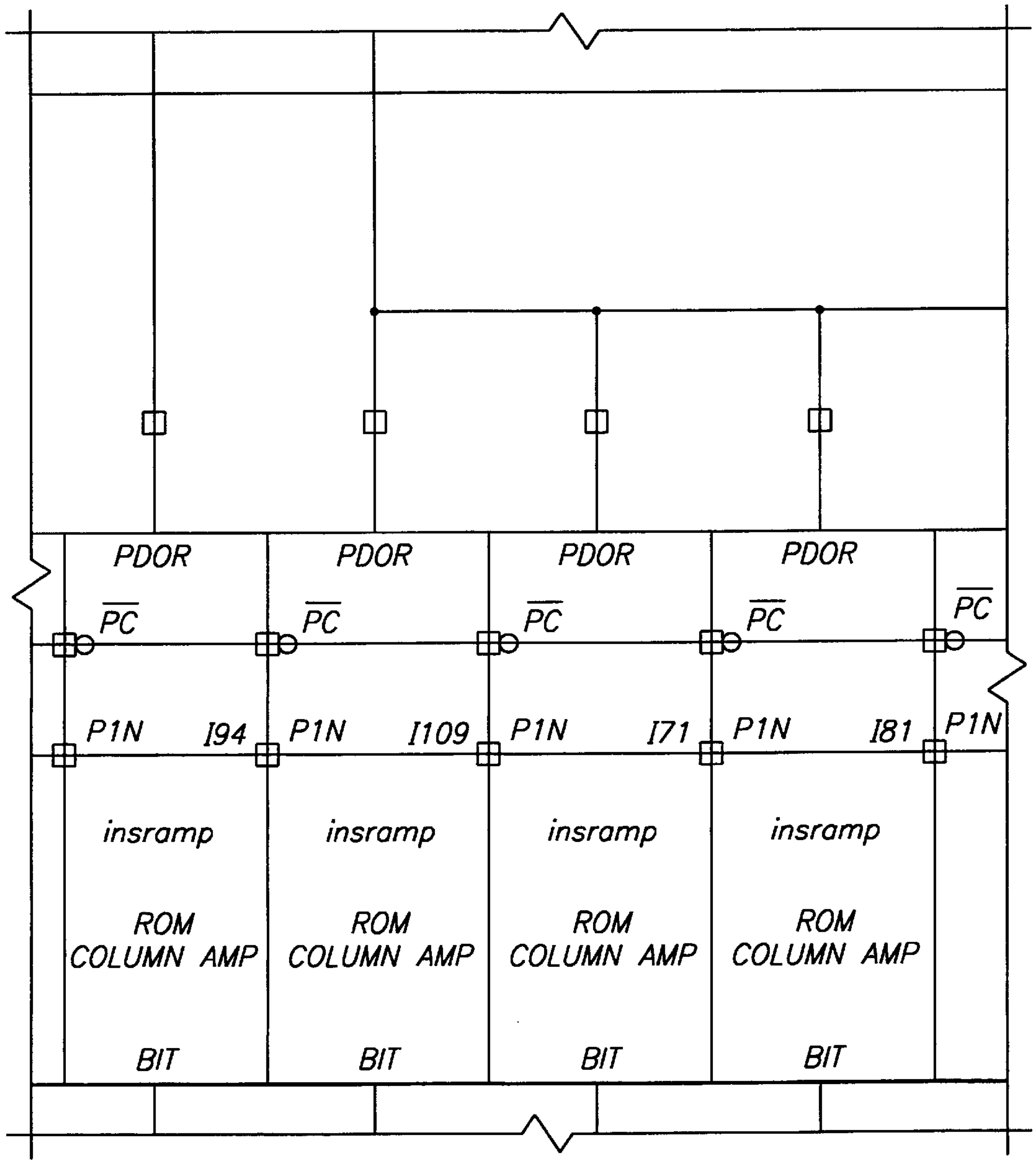
Fig 7.060IFF

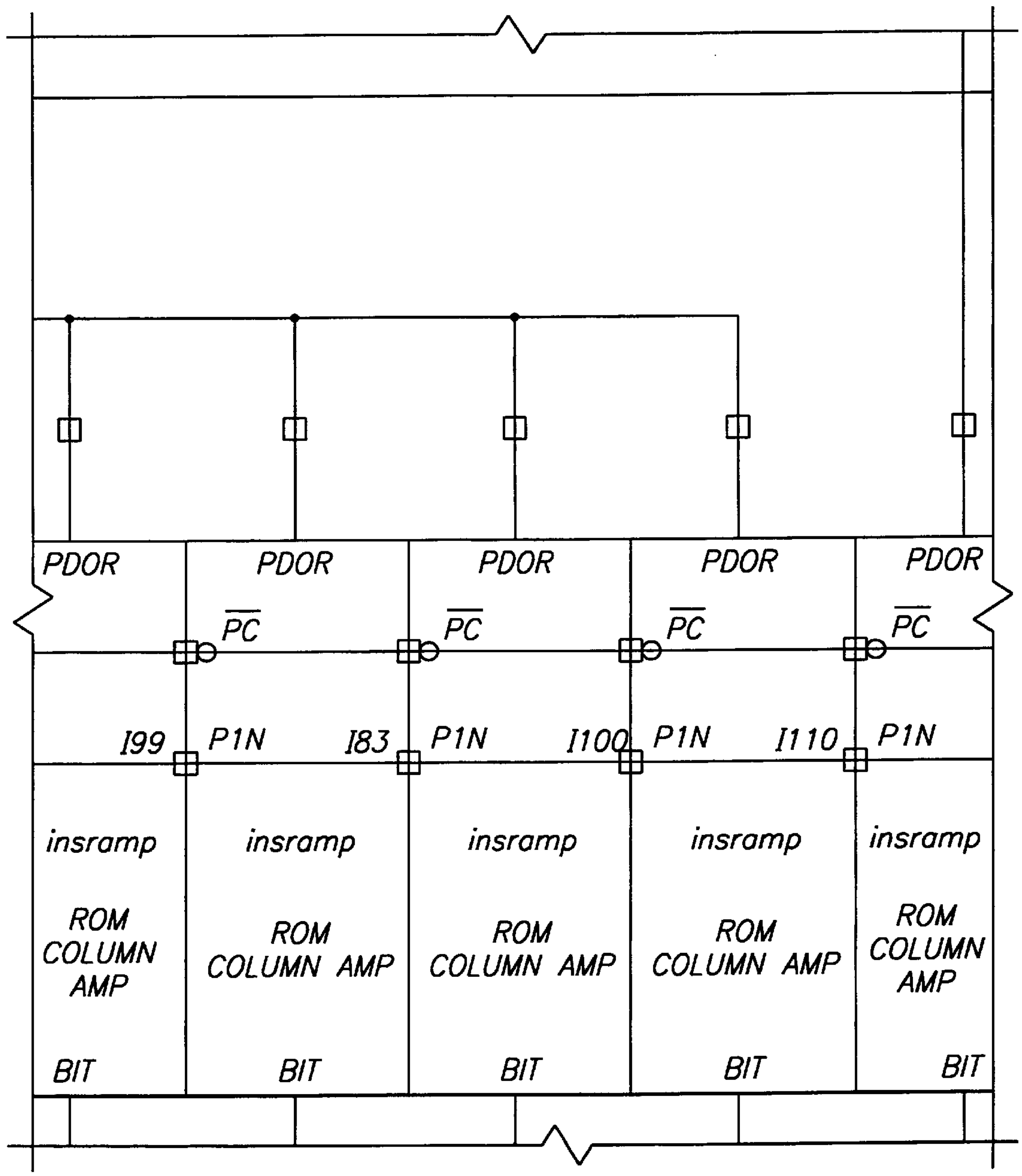
Fig 7.060IFG

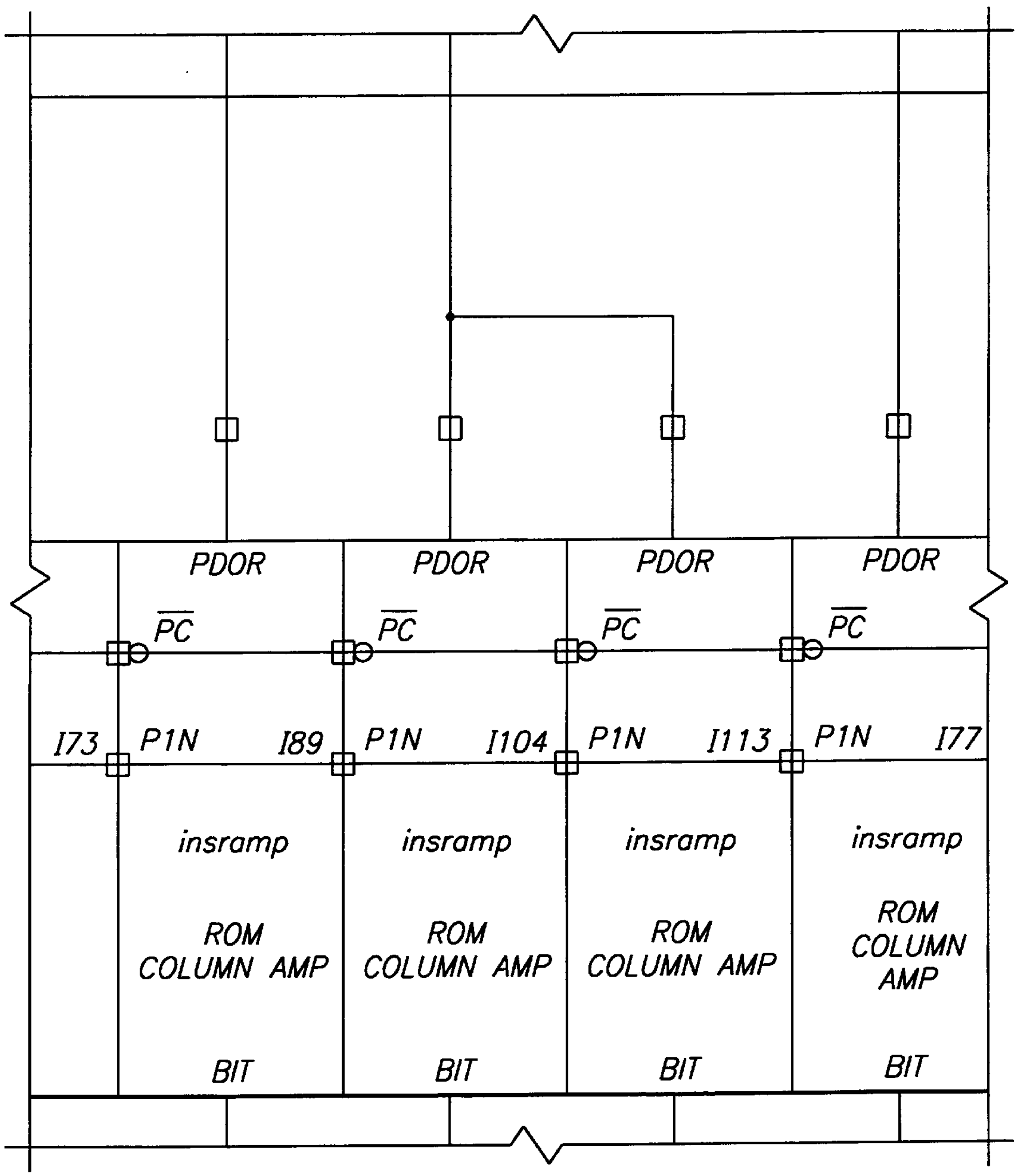
Fig. 7.06601FH

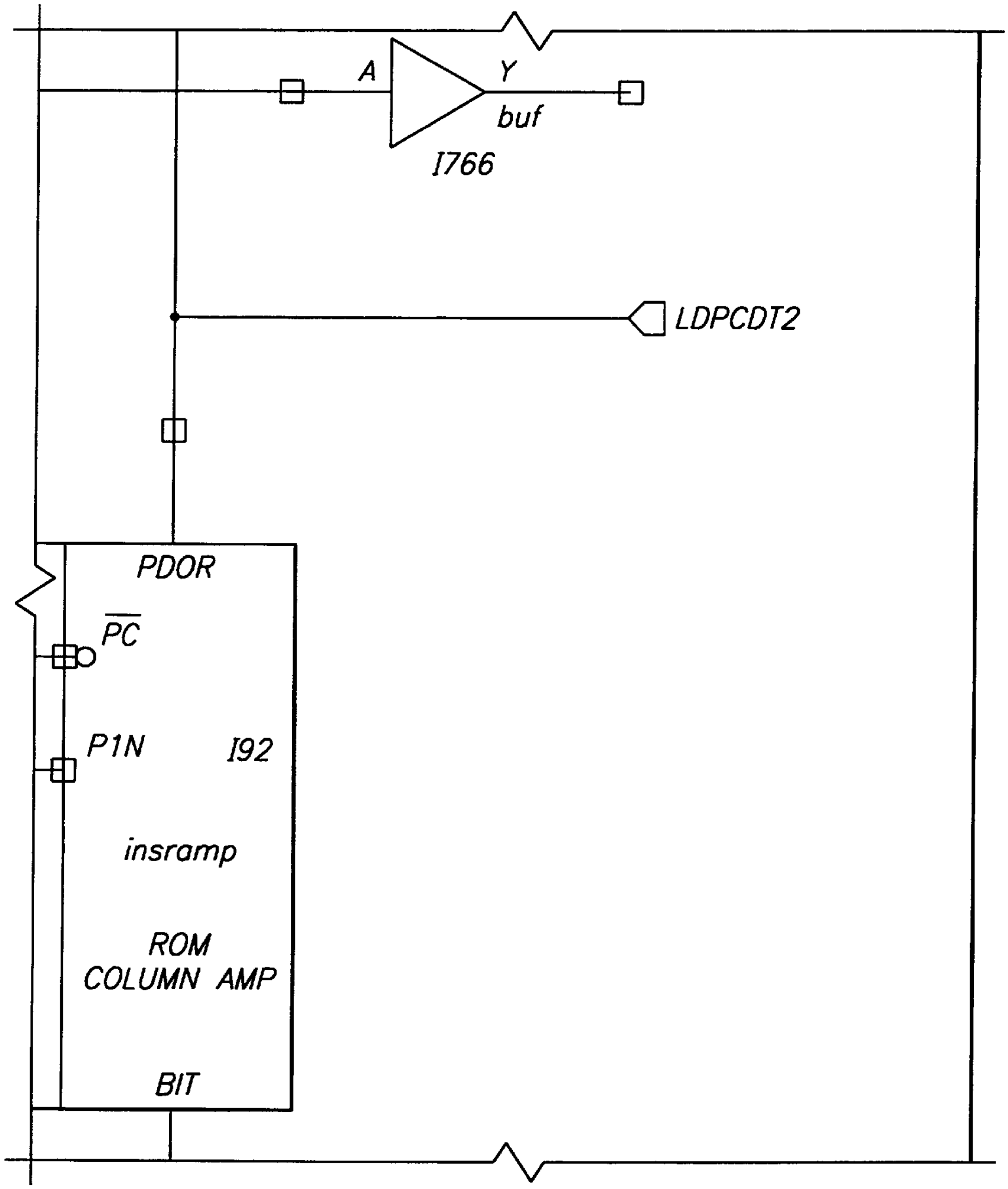
Fig 1.0601FI

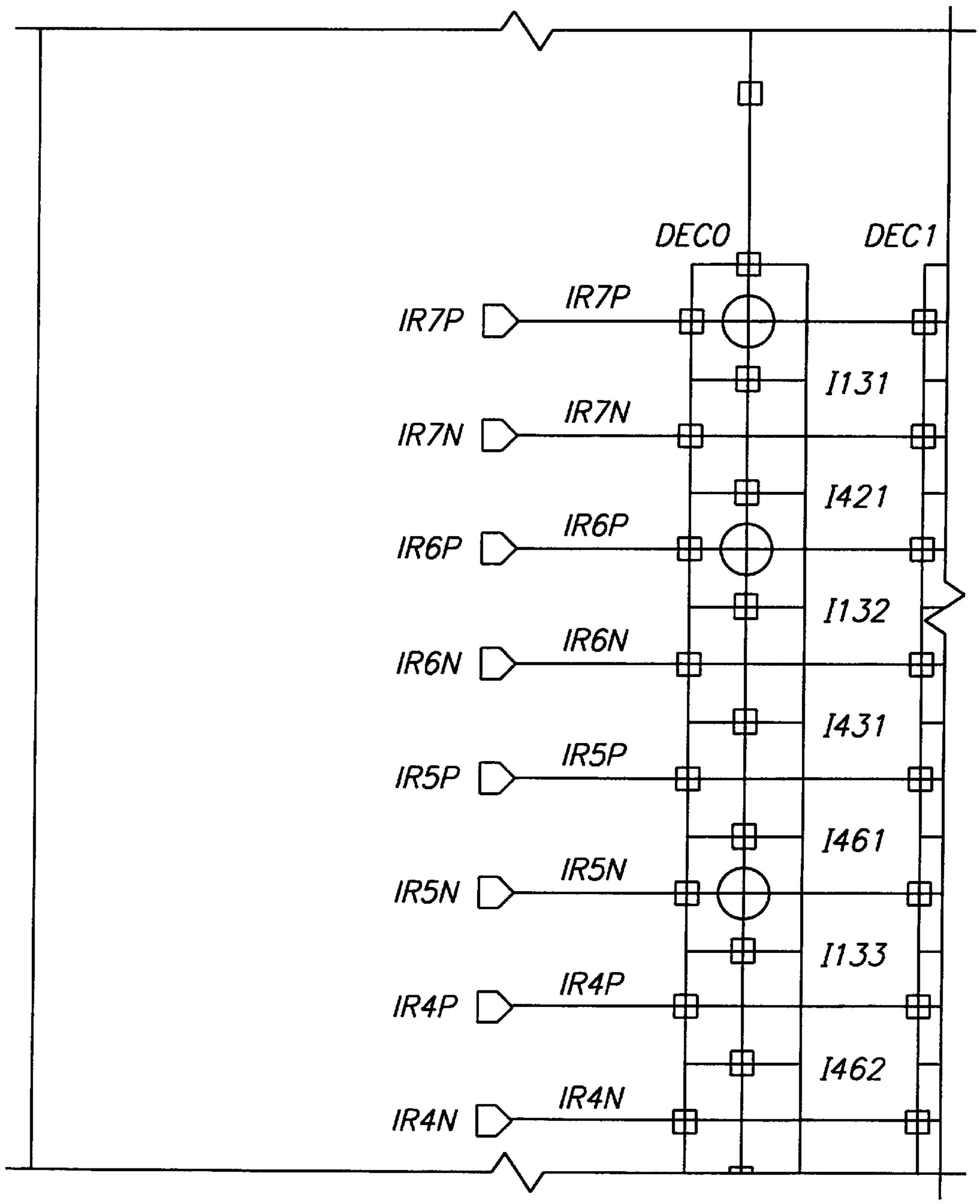
Fig 7.06C01GA

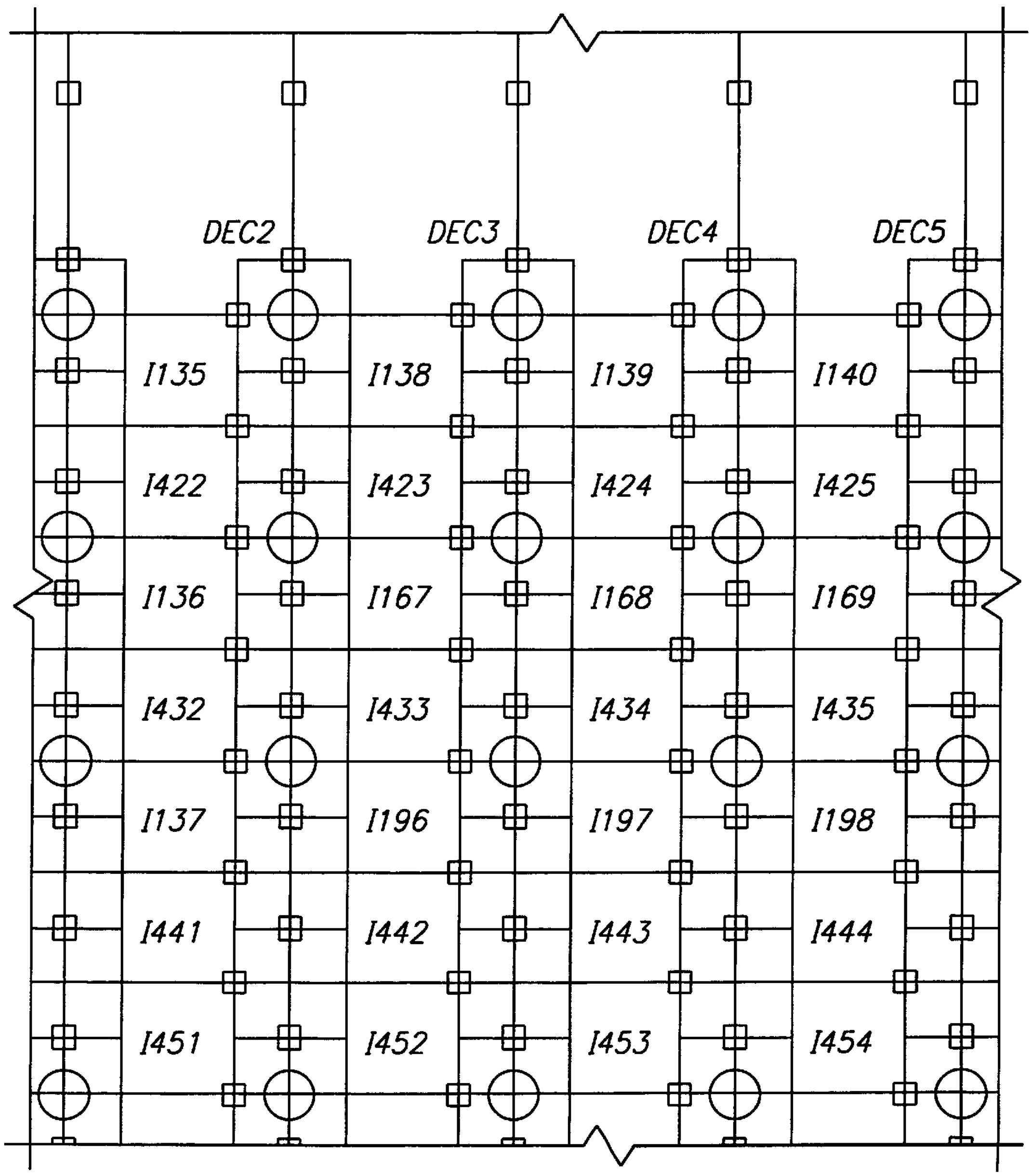
Fig 7.06016B

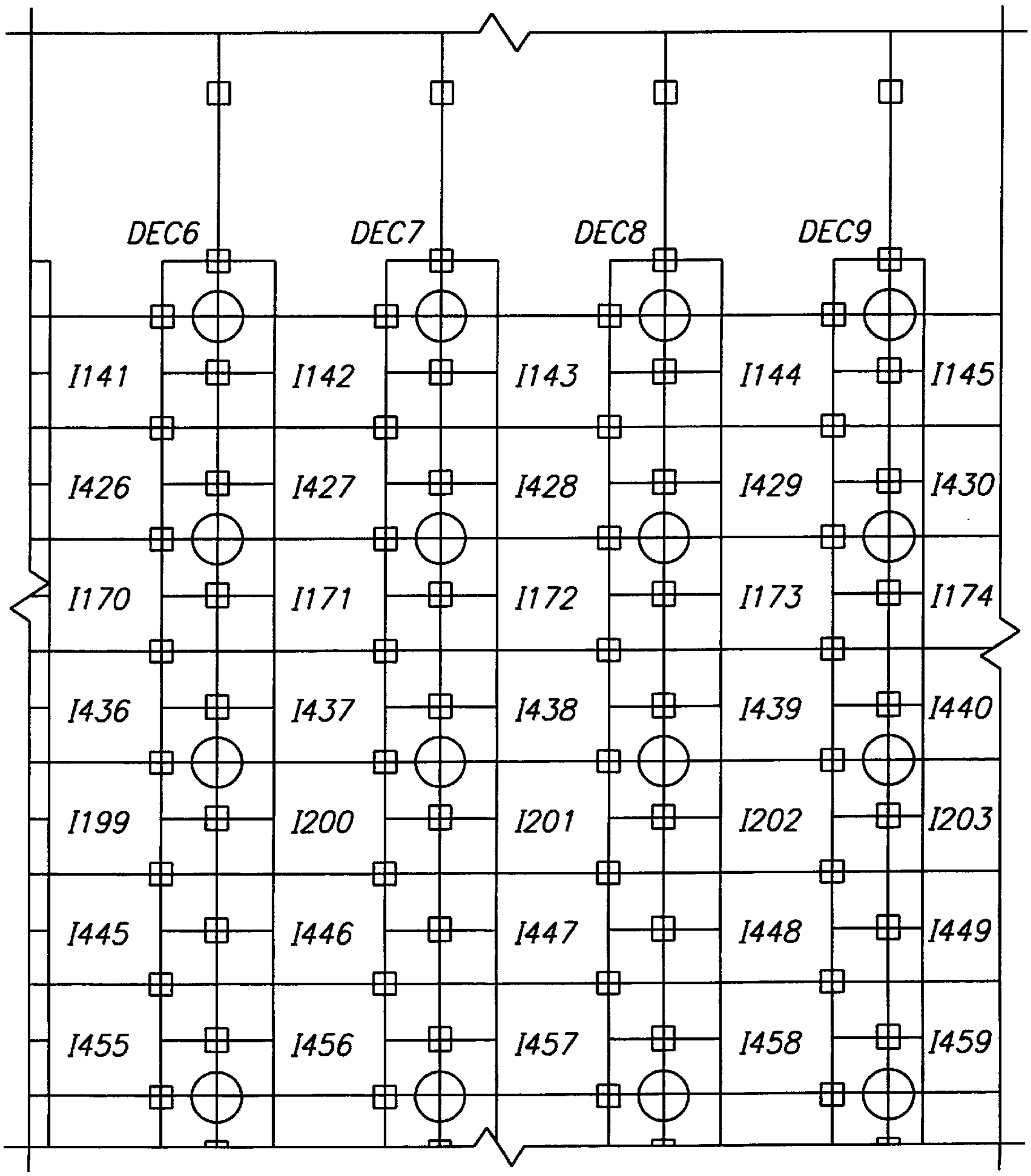
Fig 1.0601GC

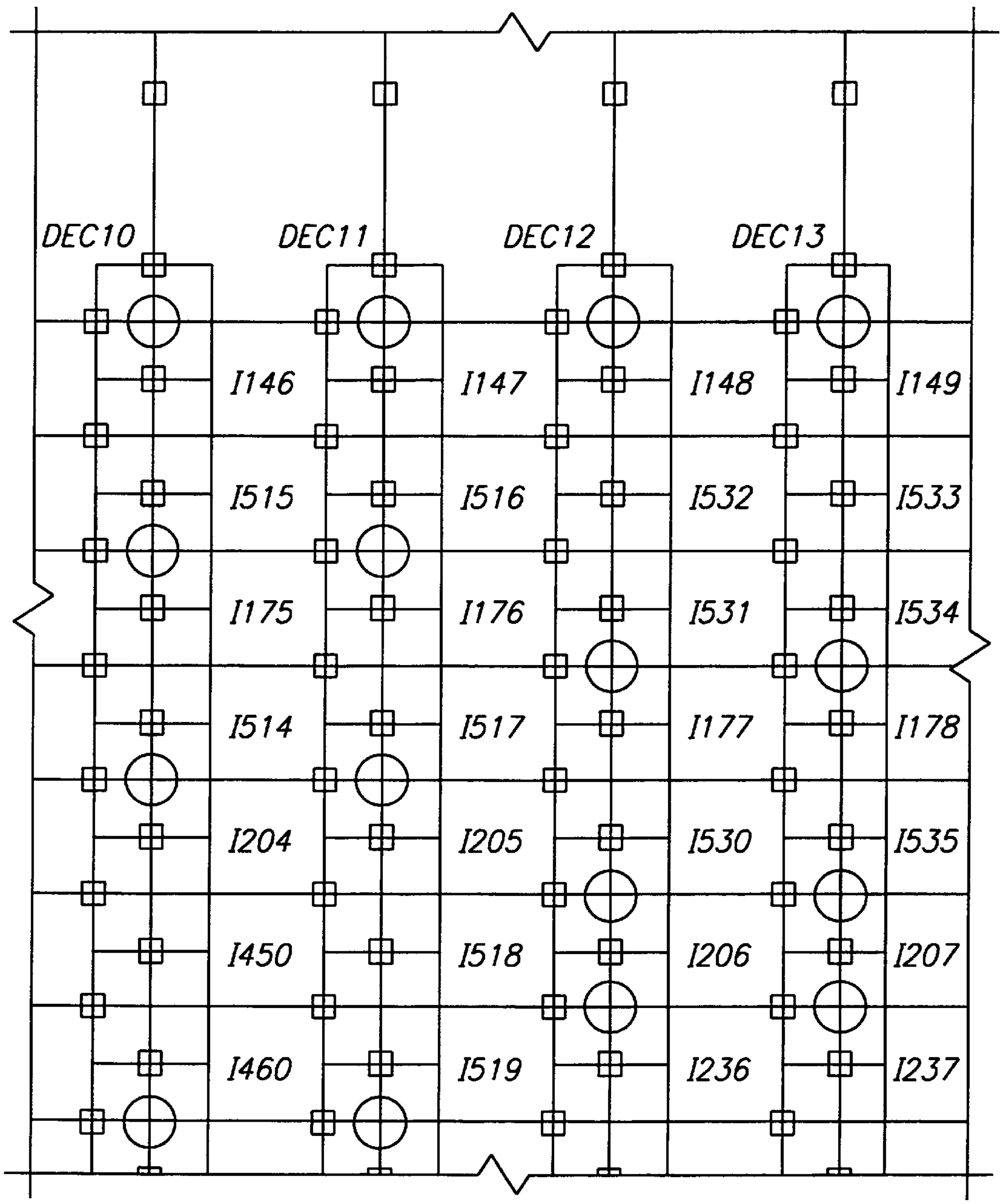
FIG. 7.06016D

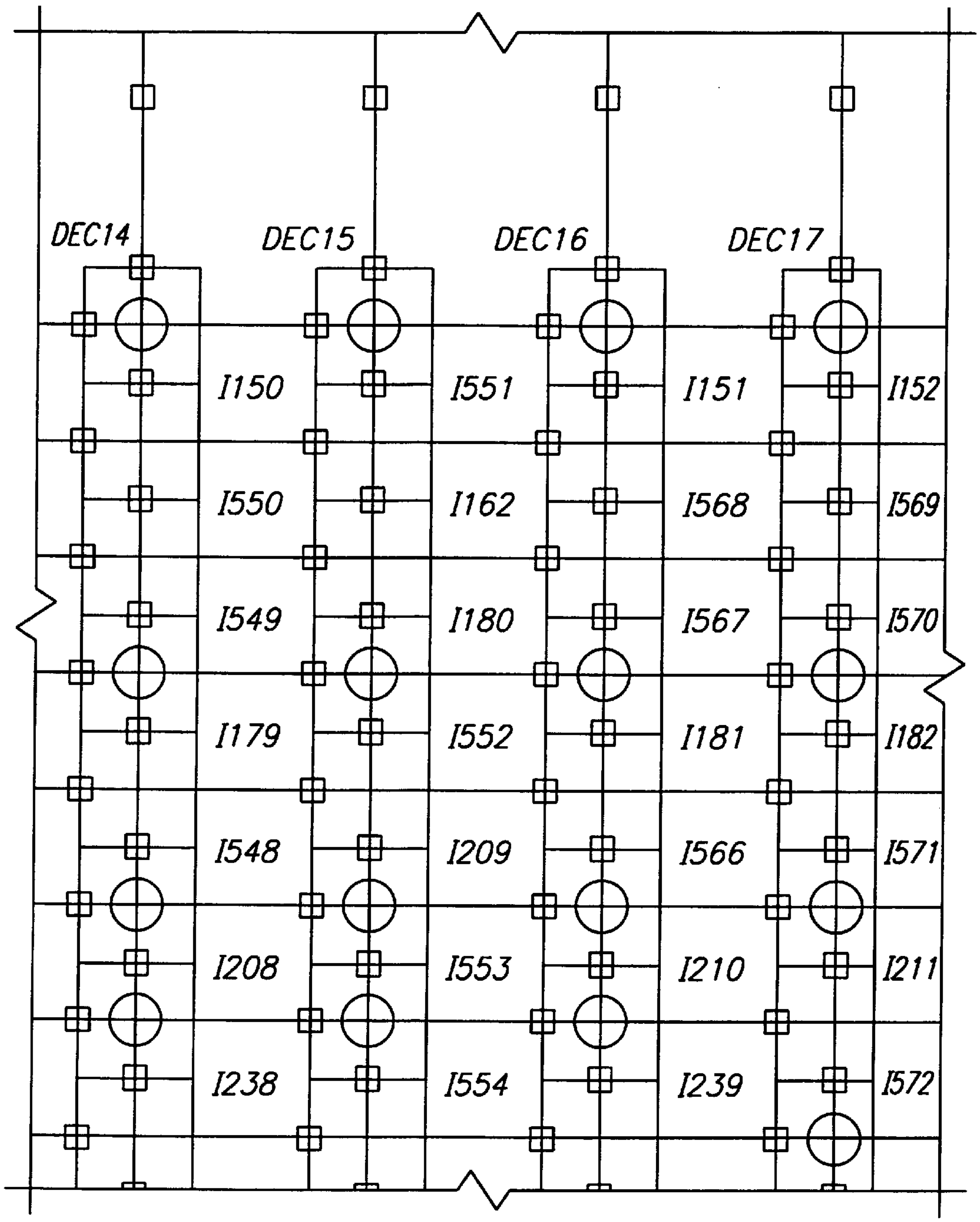
Fig 1.0601GE

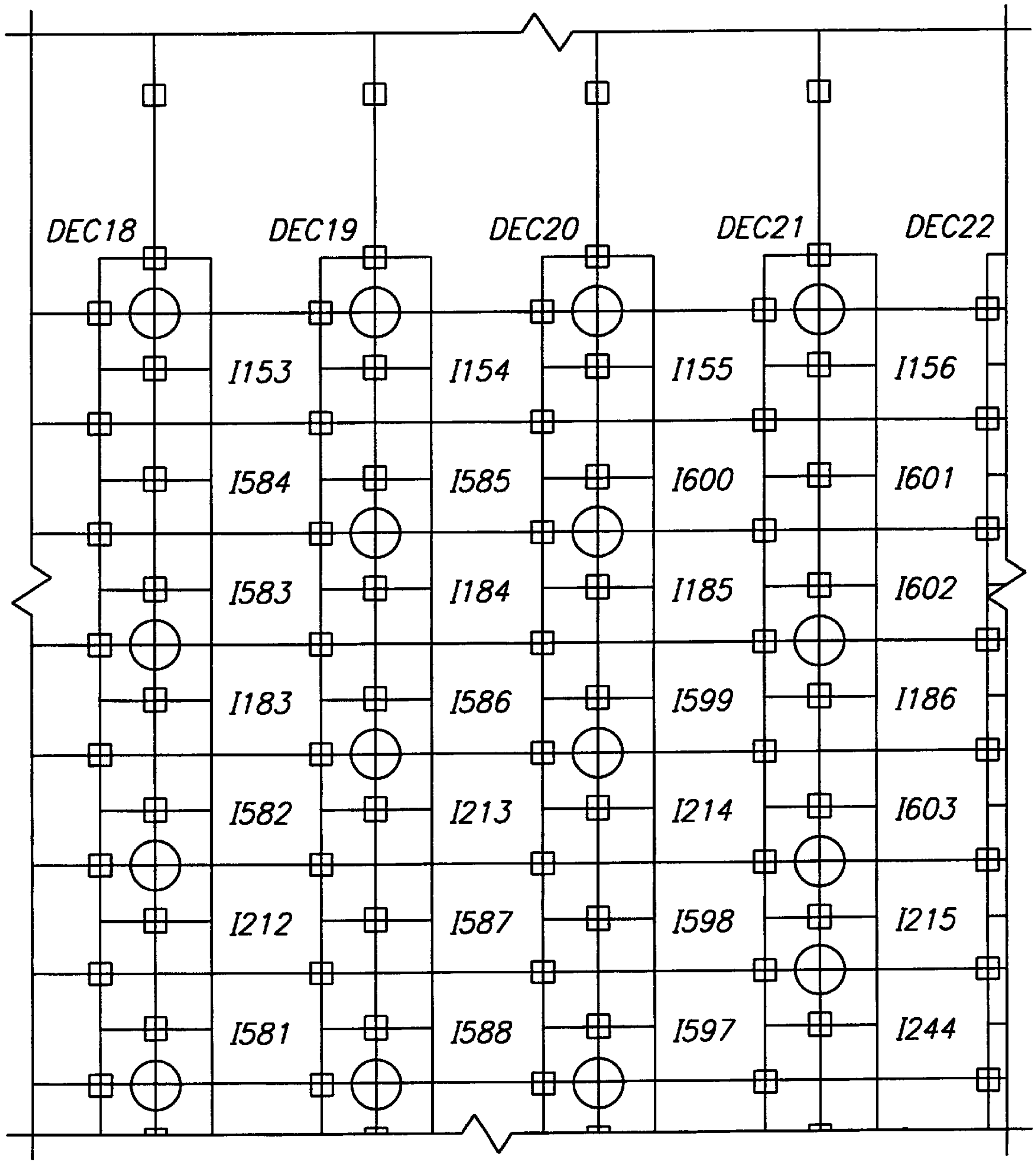
Fig 1.0601GF

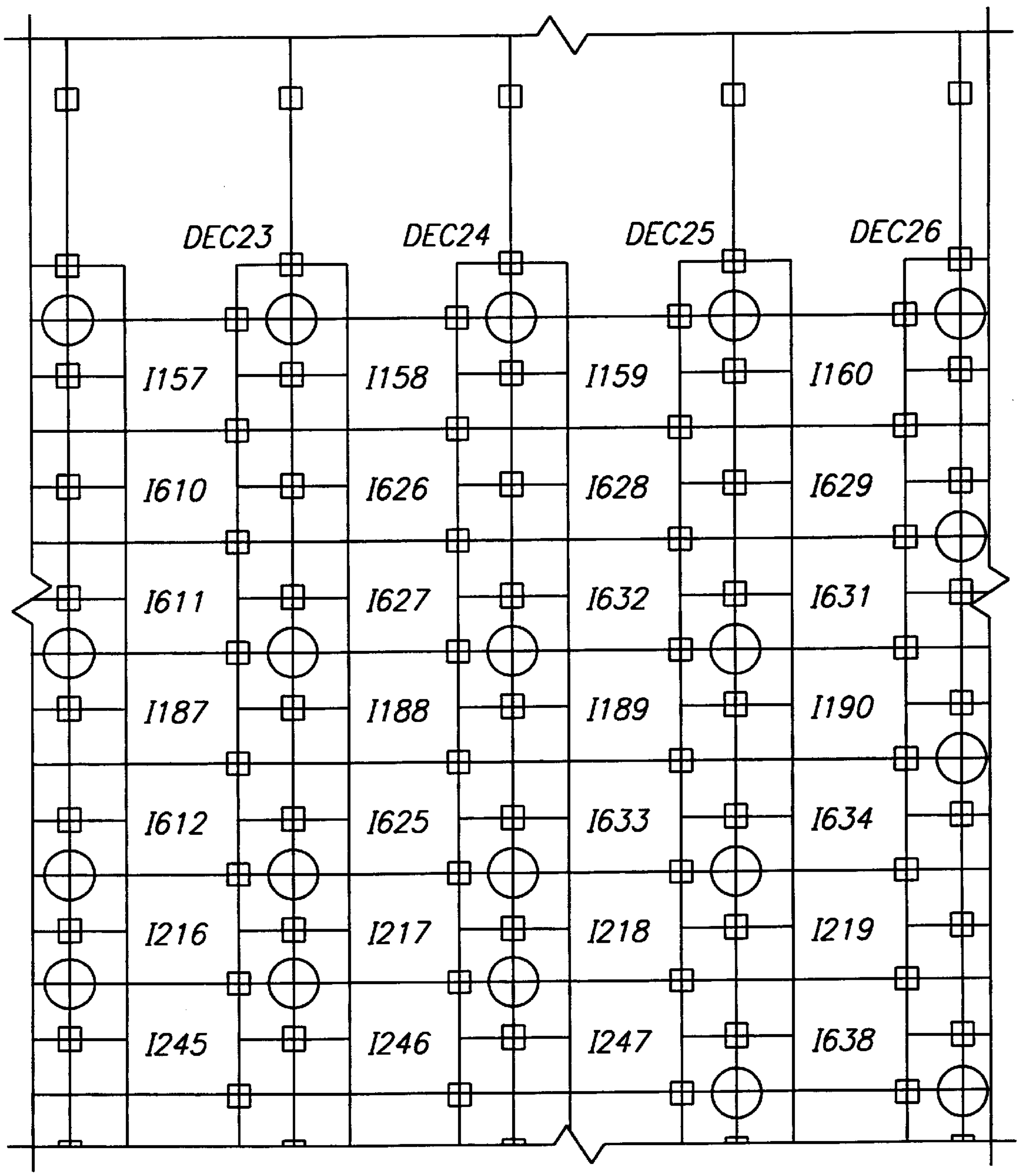
Fig 7.060166

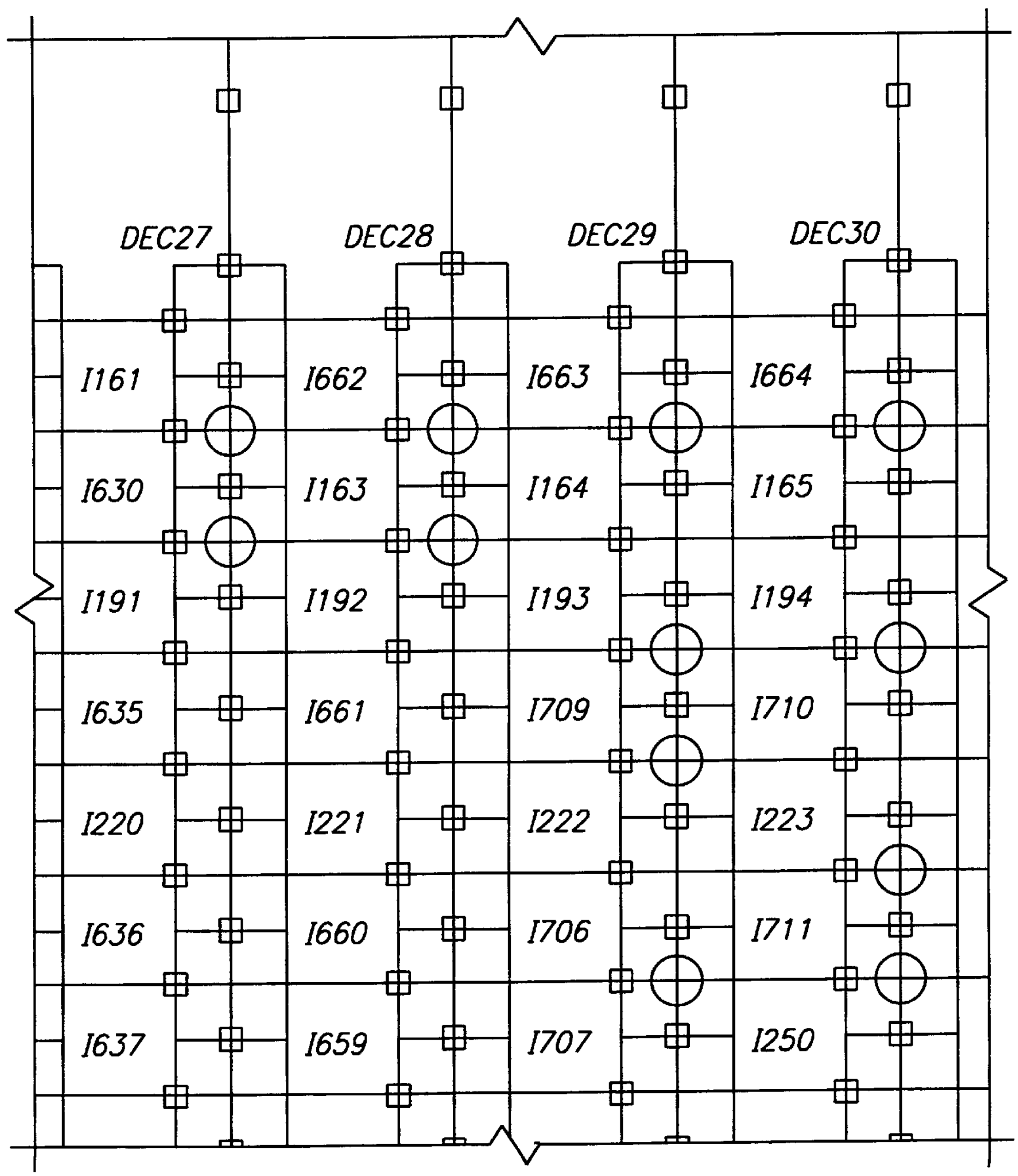
FIG 1.0601GH

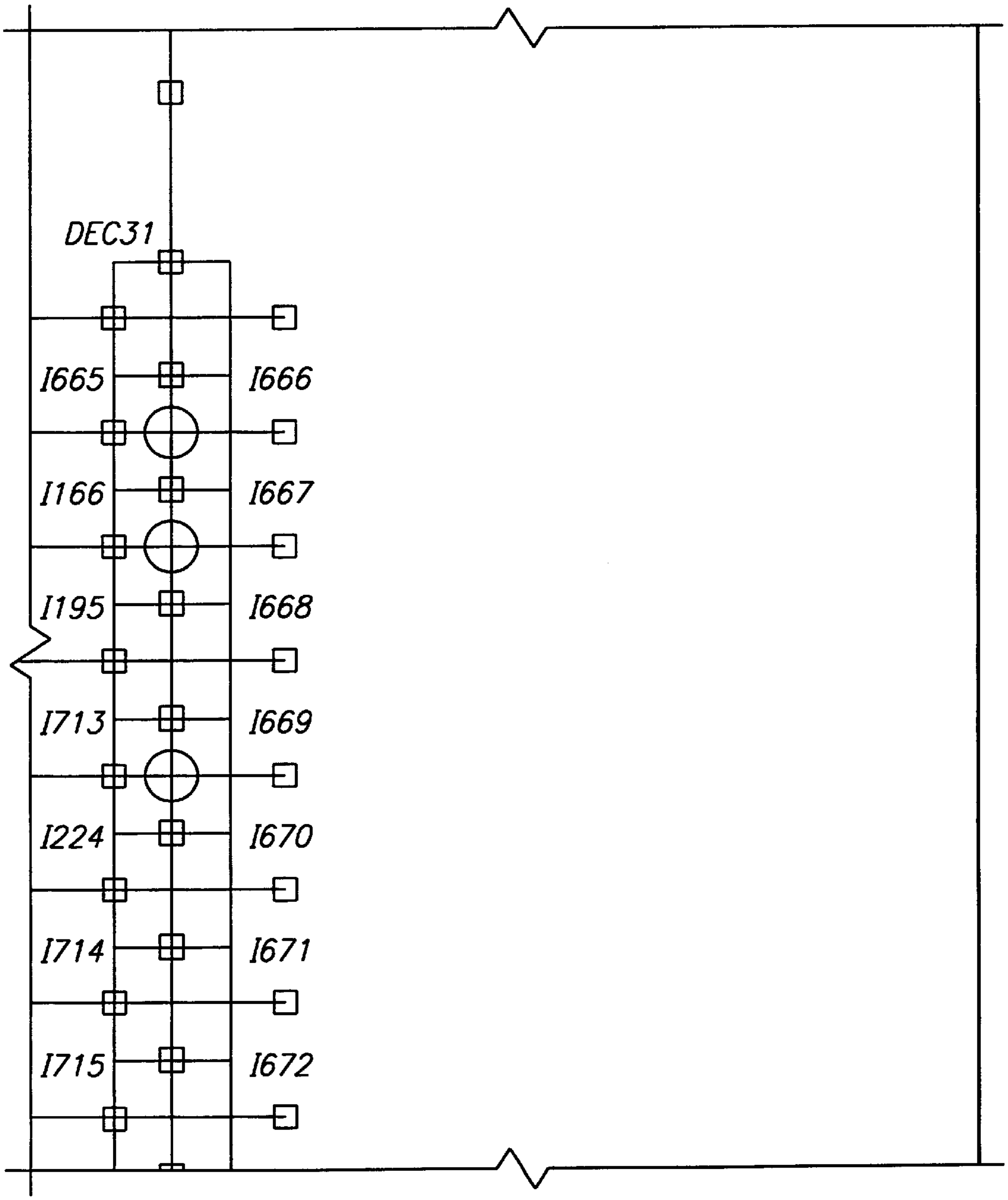
Fig 7.060IGI

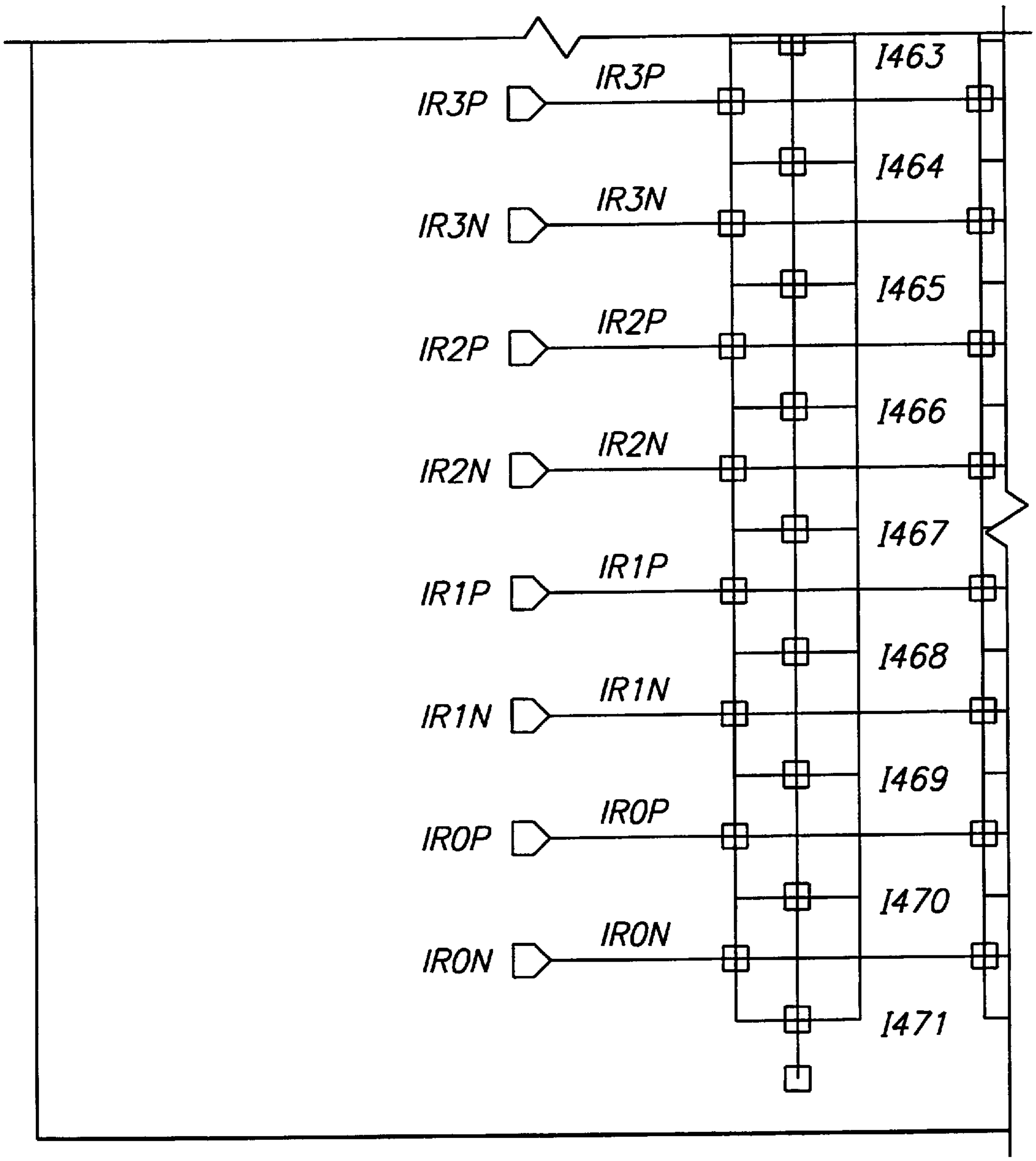
Fig 7.0601HA

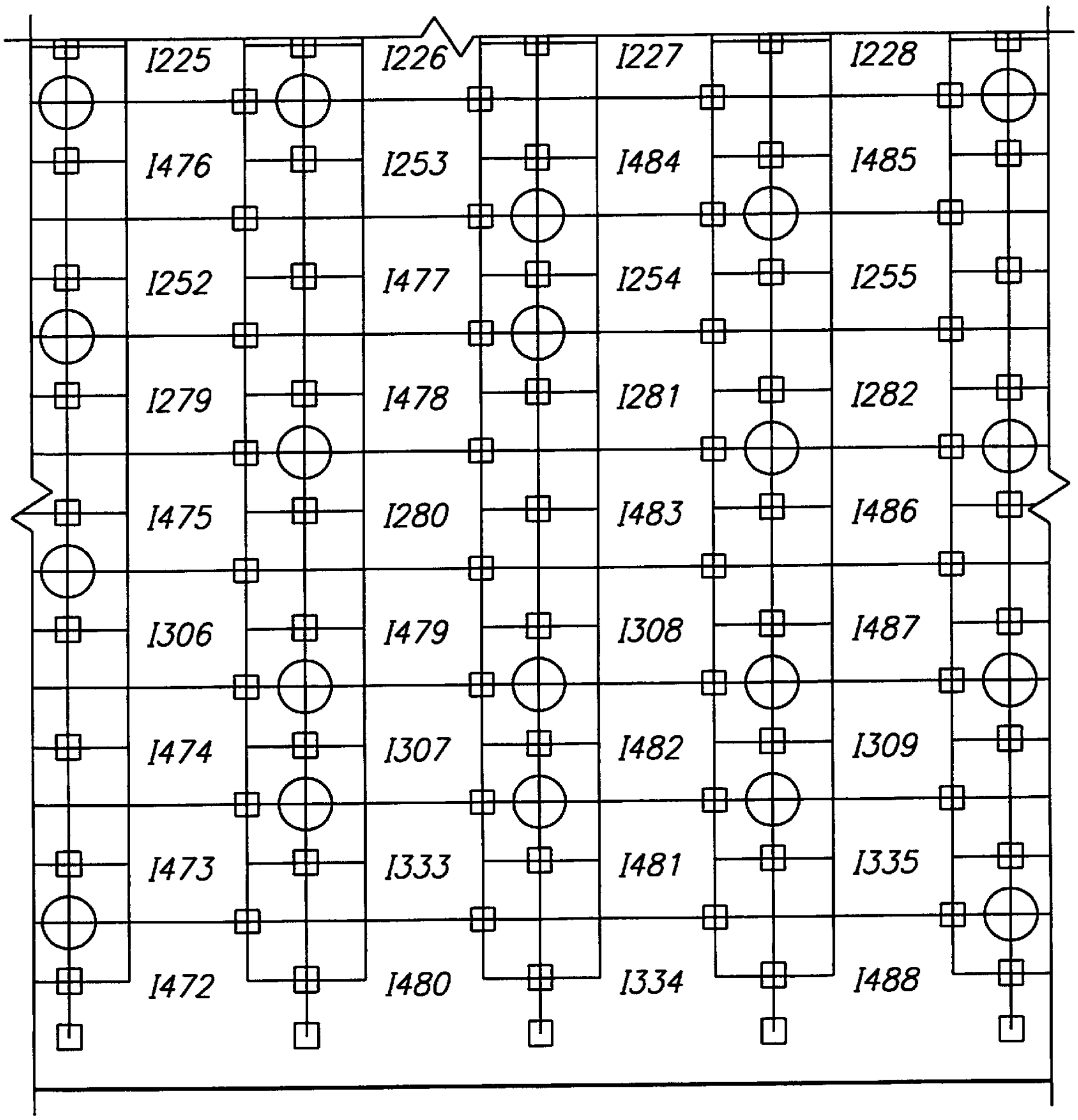
Fig 7.0601HB

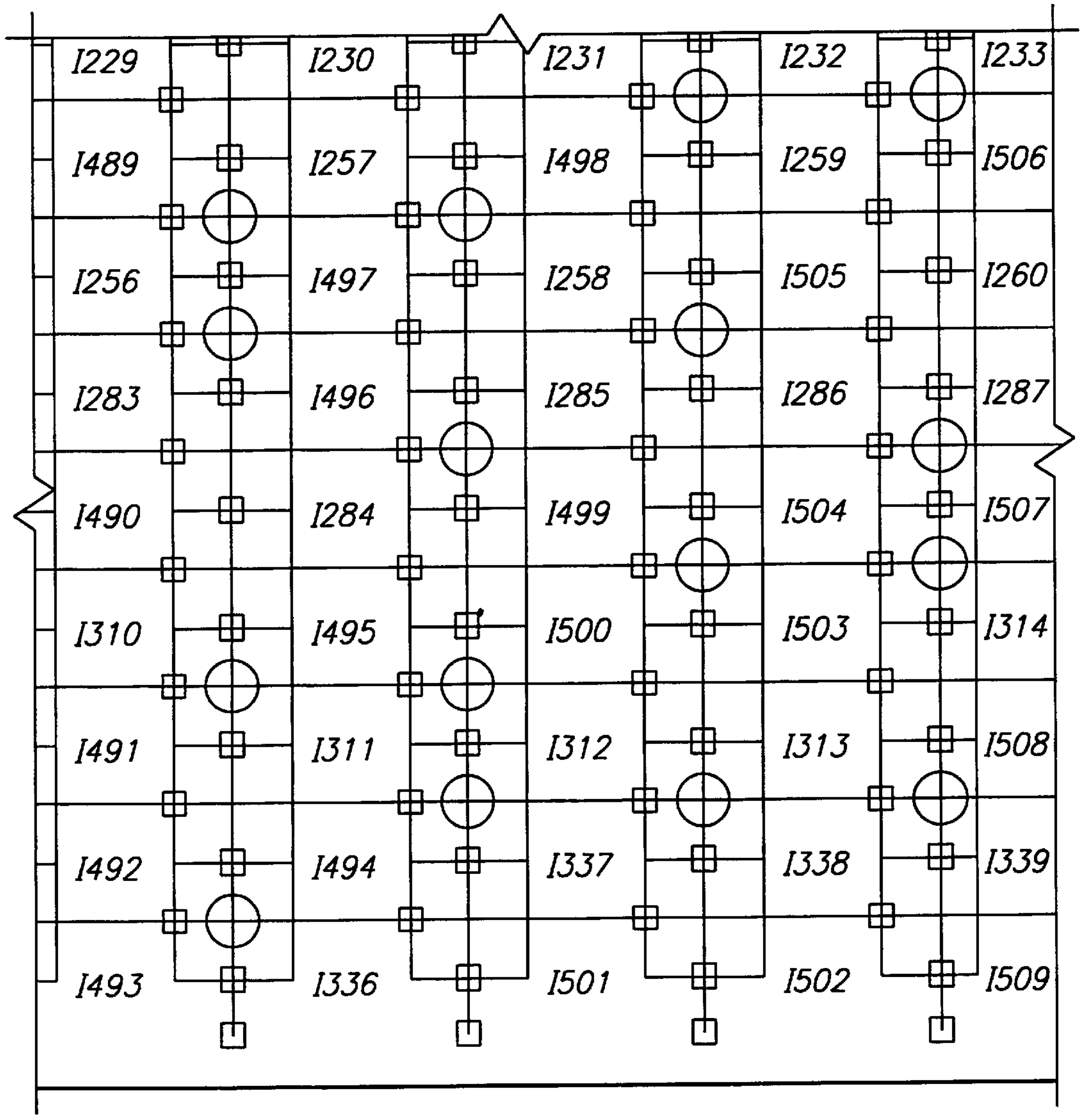
Fig 1.0601HC

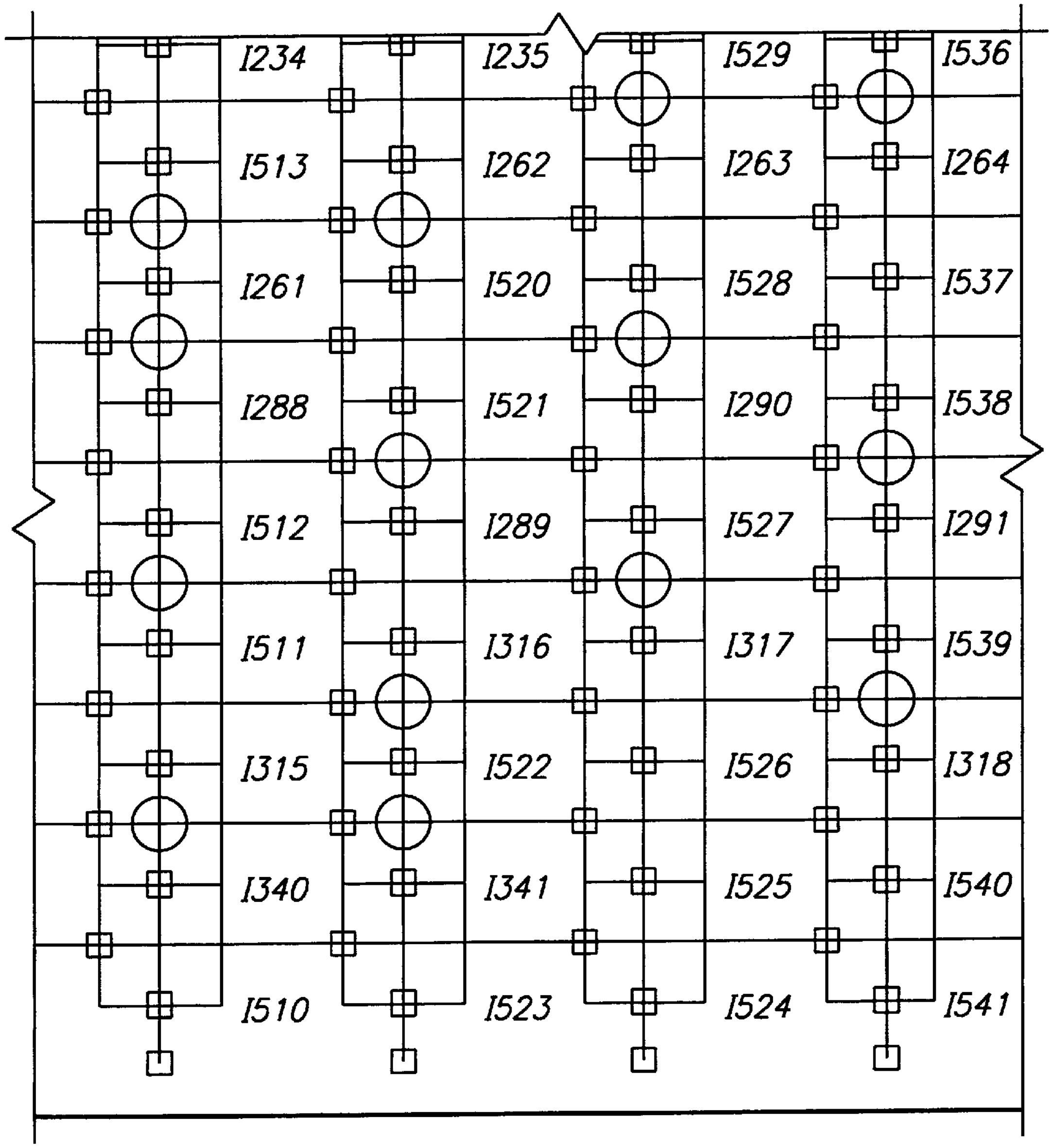
FIG. 7.0601HD

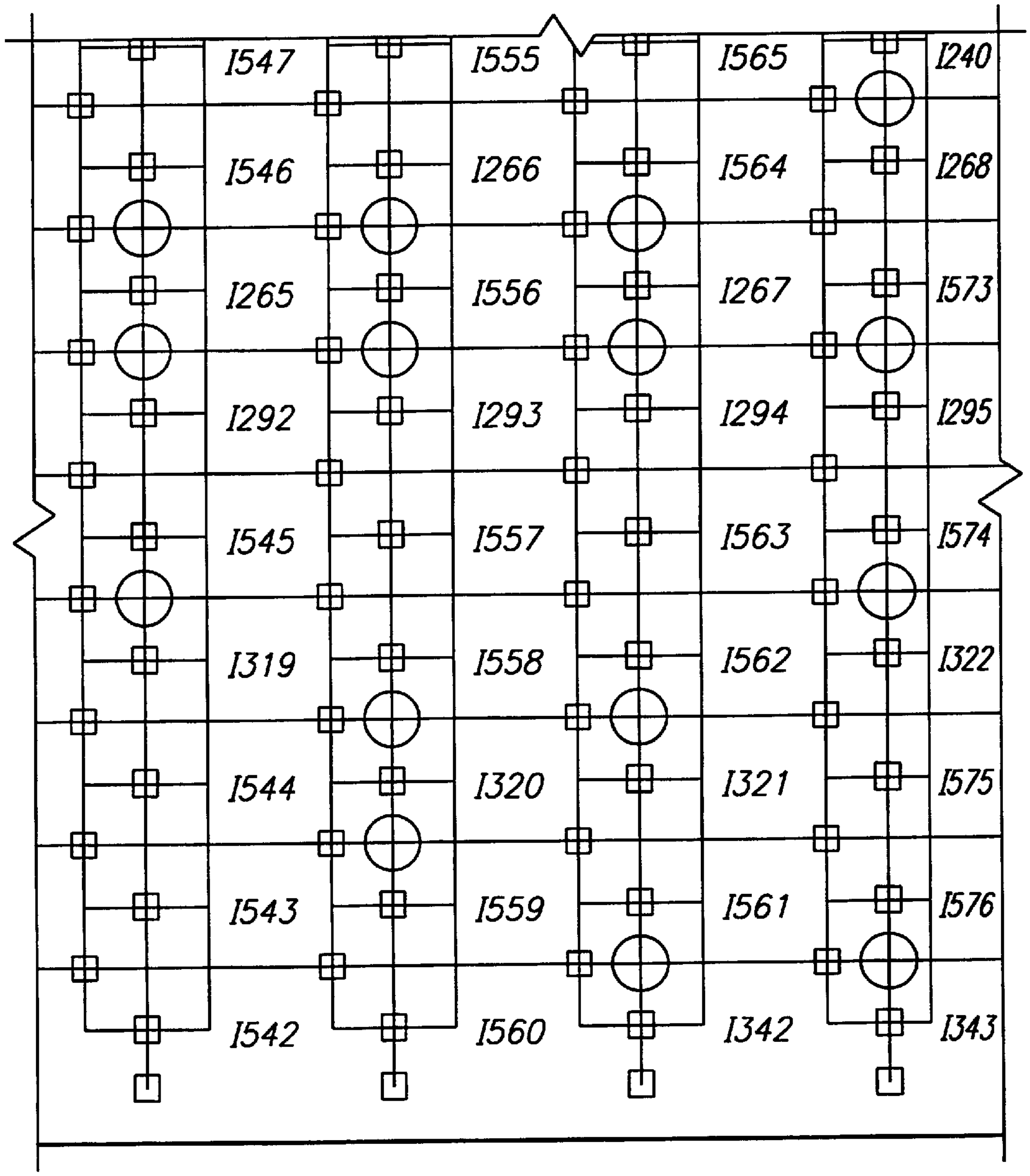
FIG. 7.0601HE

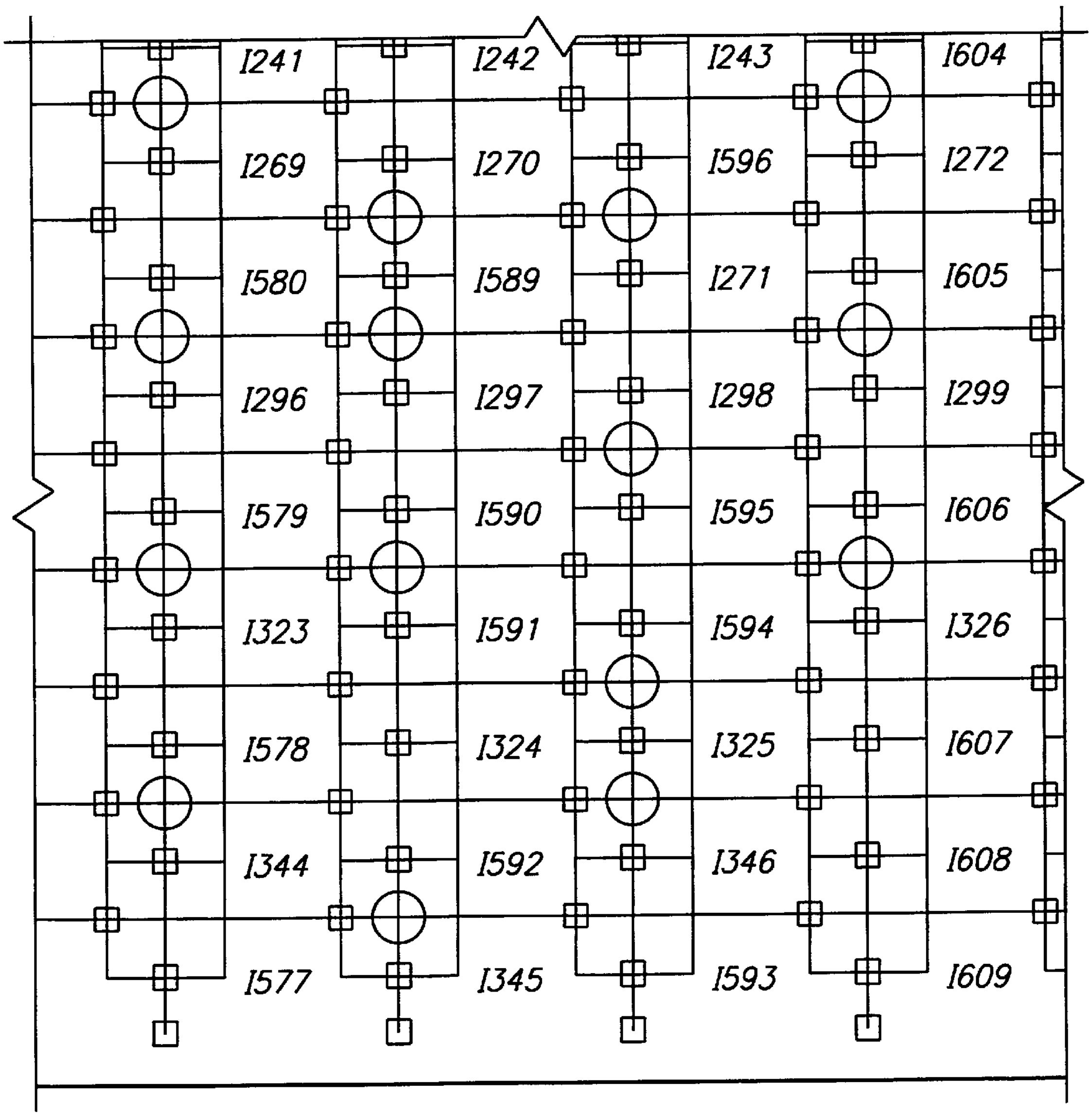
FIG. 2.0601HF

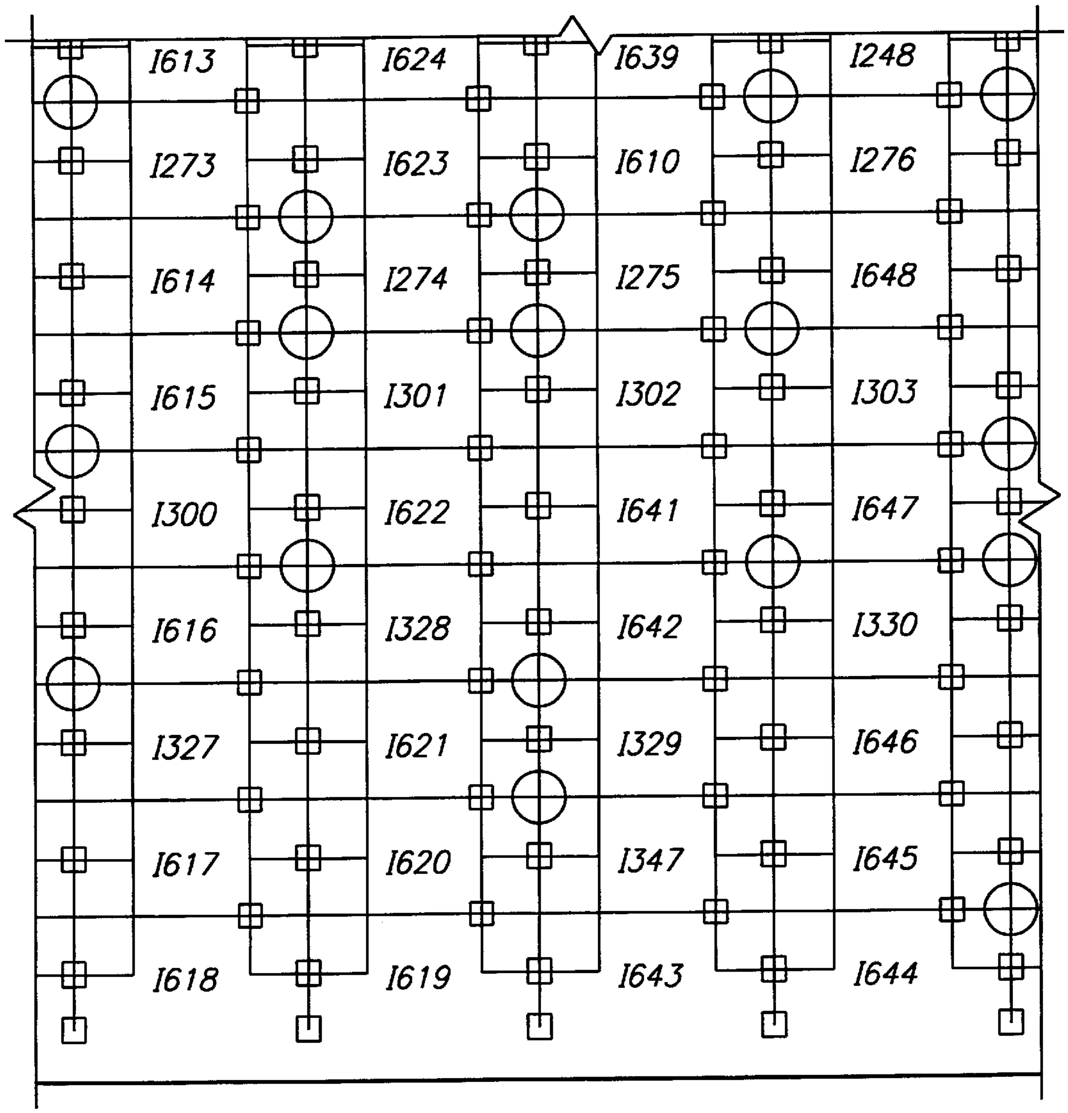
FIG. 1.0601HG

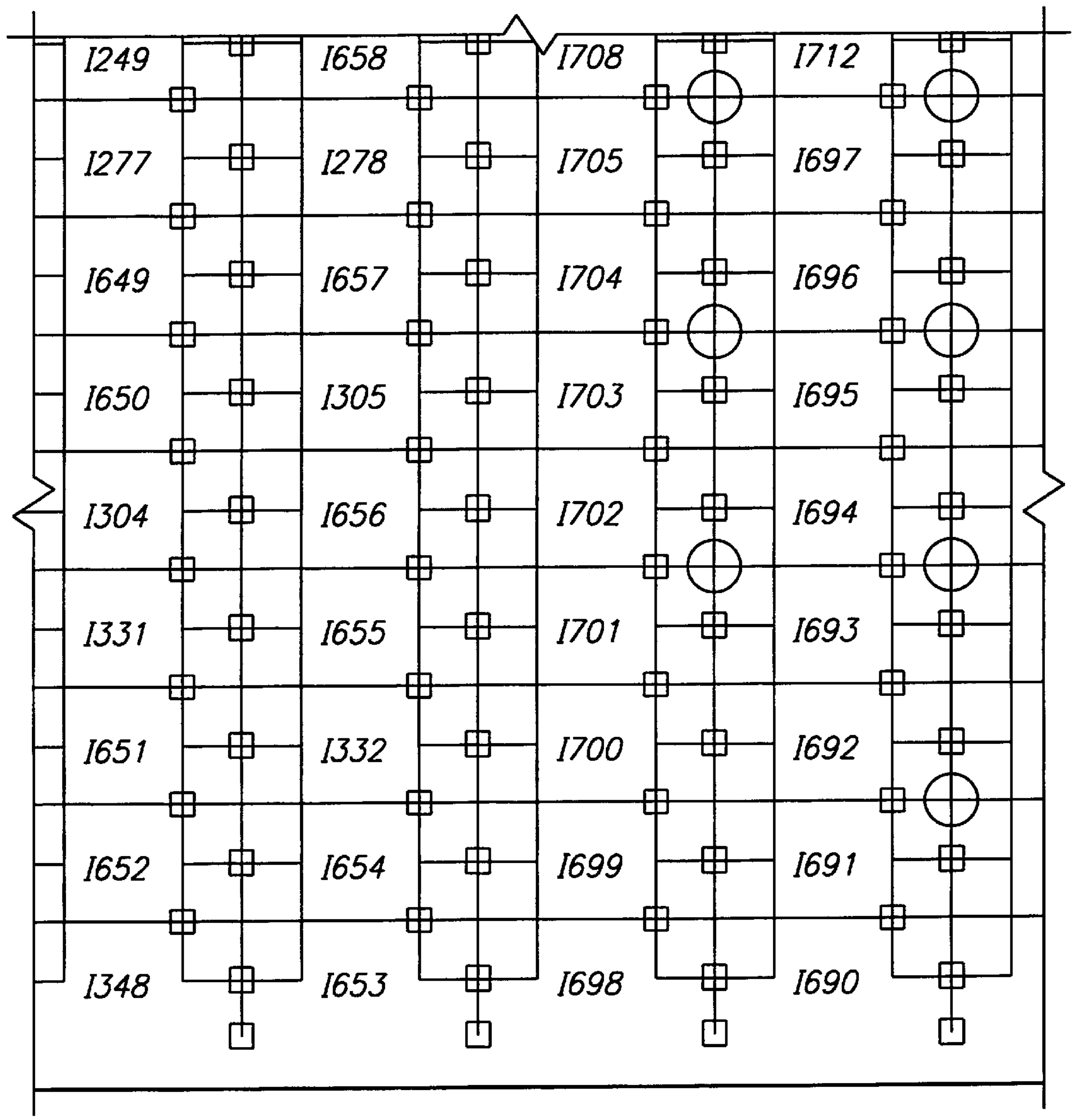
Fig 1.0601HH

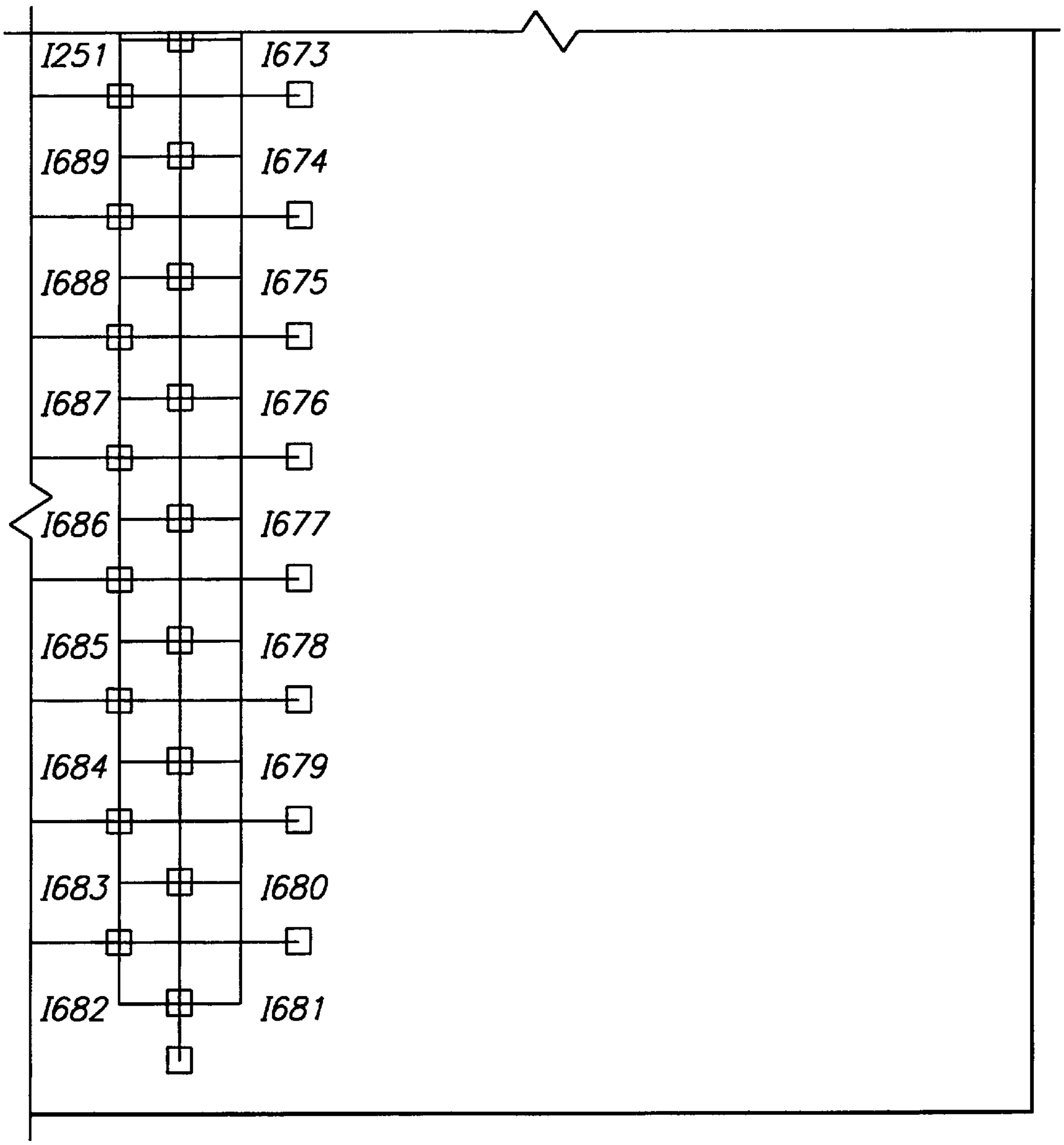
FIG 7.0601HI

| | | | | | | | |
|---|---|---|---|---|---|---|---|
| 7.0602AA | 7.0602AB | 7.0602AC | 7.0602AD | 7.0602AE | 7.0602AF | 7.0602AG | 7.0602AH |
| 7.0602BA | 7.0602BB | 7.0602BC | 7.0602BD | 7.0602BE | 7.0602BF | 7.0602BG | 7.0602BH |
| 7.0602CA | 7.0602CB | 7.0602CC | 7.0602CD | 7.0602CE | 7.0602CF | 7.0602CG | 7.0602CH |
| 7.0602DA | 7.0602DB | 7.0602DC | 7.0602DD | 7.0602DE | 7.0602DF | 7.0602DG | 7.0602DH |
| 7.0602EA | 7.0602EB | 7.0602EC | 7.0602ED | 7.0602EE | 7.0602EF | 7.0602EG | 7.0602EH |
| 7.0602FA | 7.0602FB | 7.0602FC | 7.0602FD | 7.0602FE | 7.0602FF | 7.0602FG | 7.0602FH |
| 7.0602GA | 7.0602GB | 7.0602GC | 7.0602GD | 7.0602GE | 7.0602GF | 7.0602GG | 7.0602GH |
| 7.0602HA | 7.0602HB | 7.0602HC | 7.0602HD | 7.0602HE | 7.0602HF | 7.0602HG | 7.0602HH |
| | | 7.0602IC | 7.0602ID | 7.0602IE | 7.0602IF | 7.0602IG | 7.0602IH |
| | | 7.0602JC | 7.0602JD | 7.0602JE | 7.0602JF | 7.0602JG | 7.0602JH |

Fig 7.0602

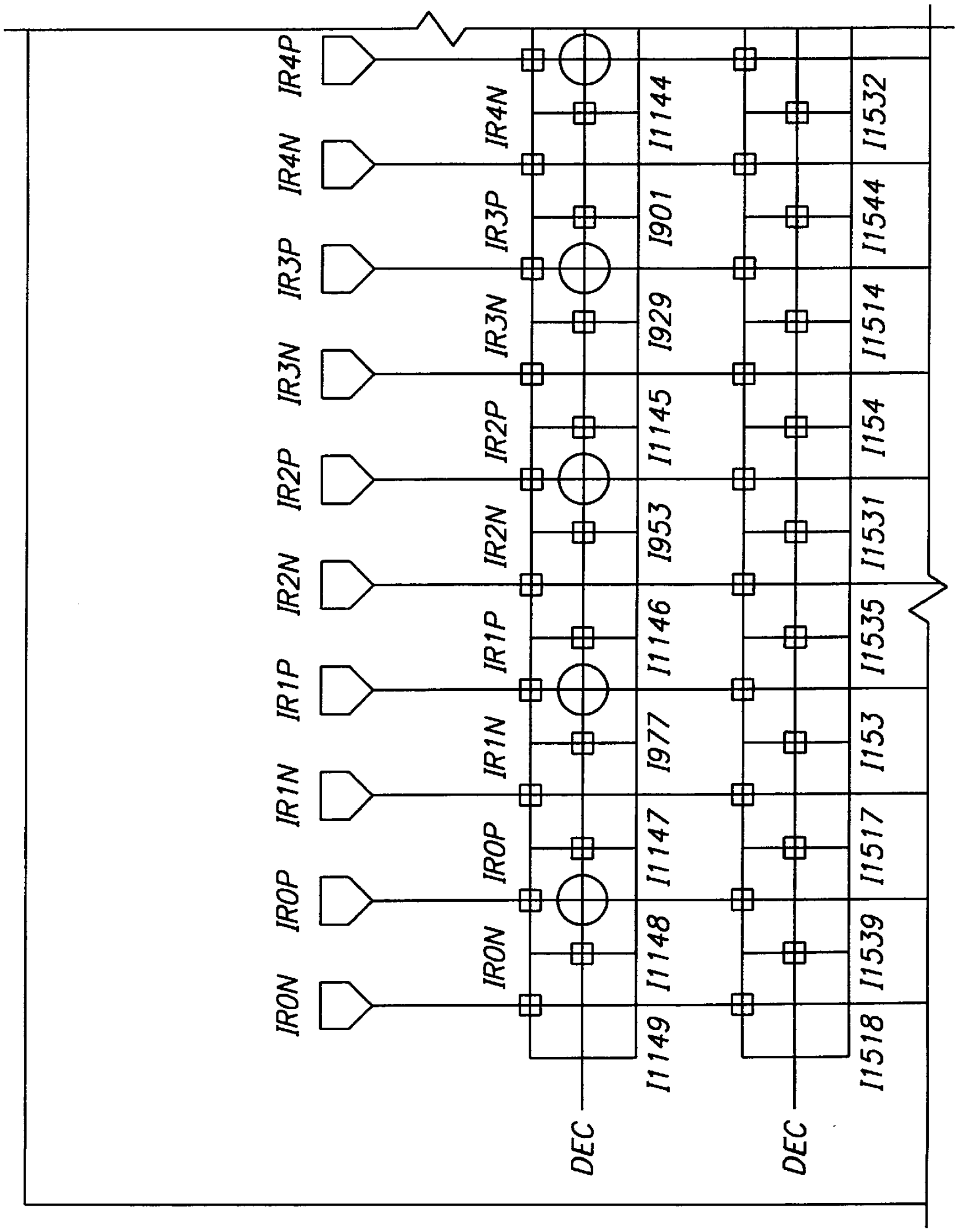
FIG. 7.06O2AA

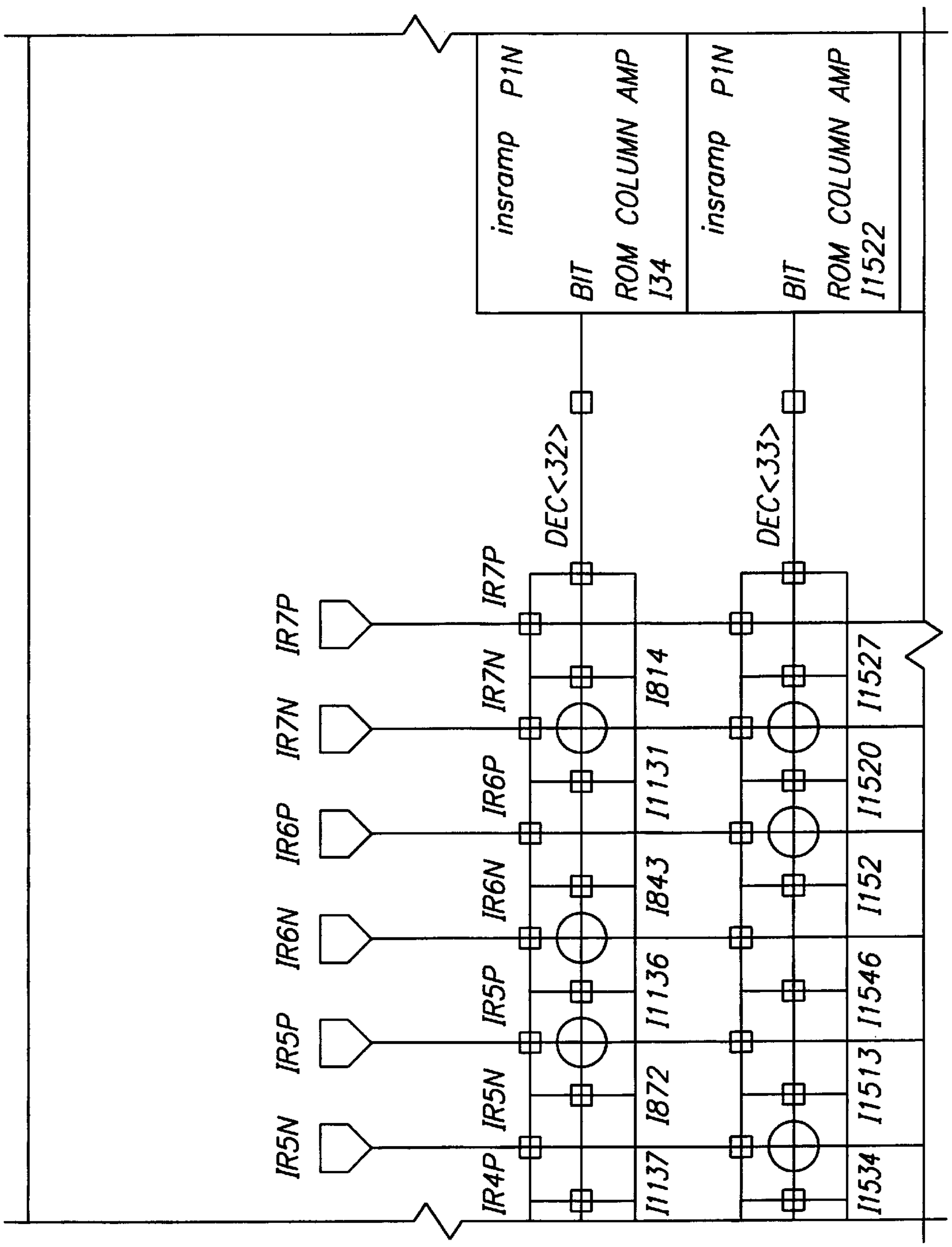
FIG. 7.0602AB

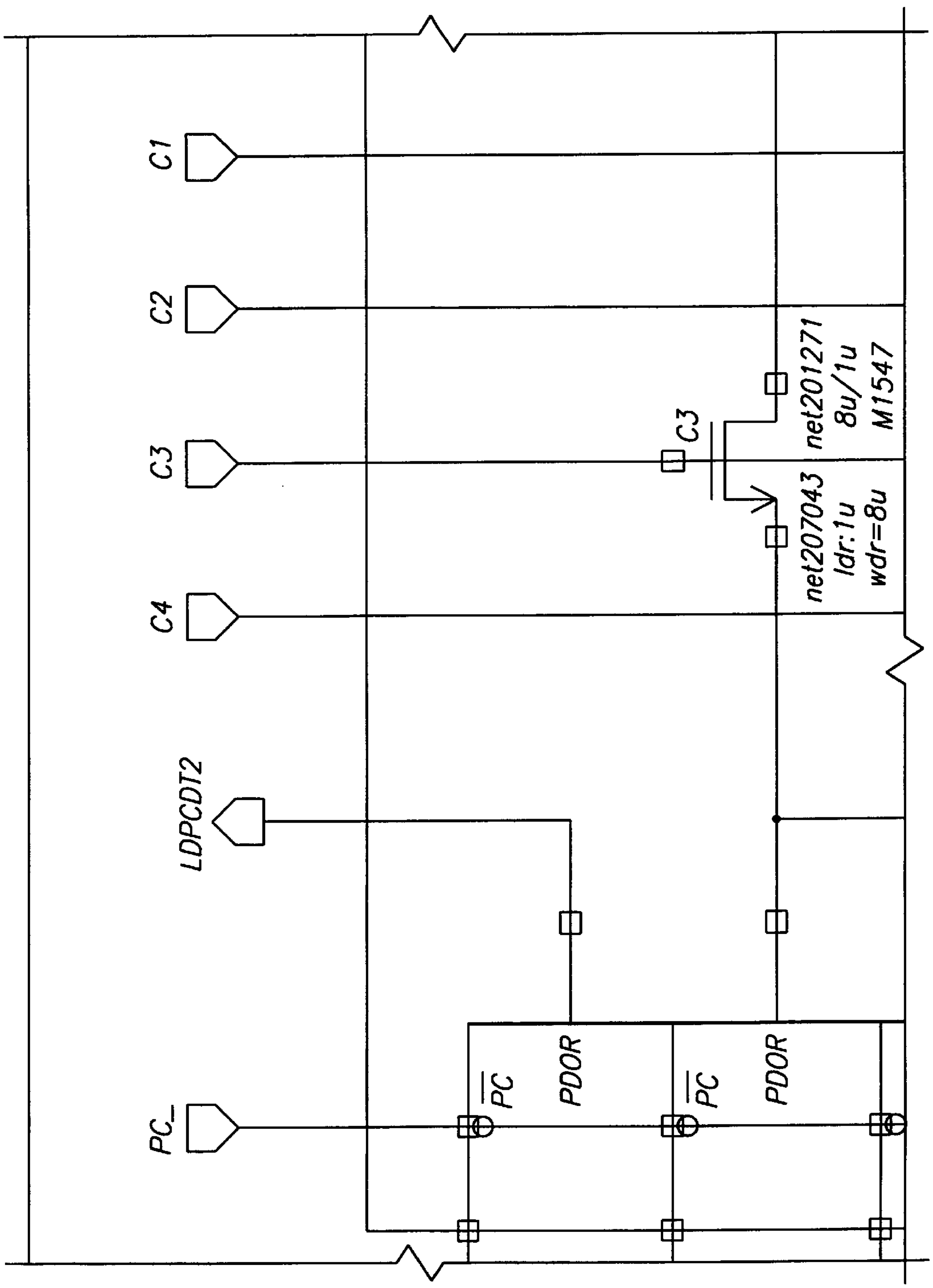
FIG. 7.066ZAC

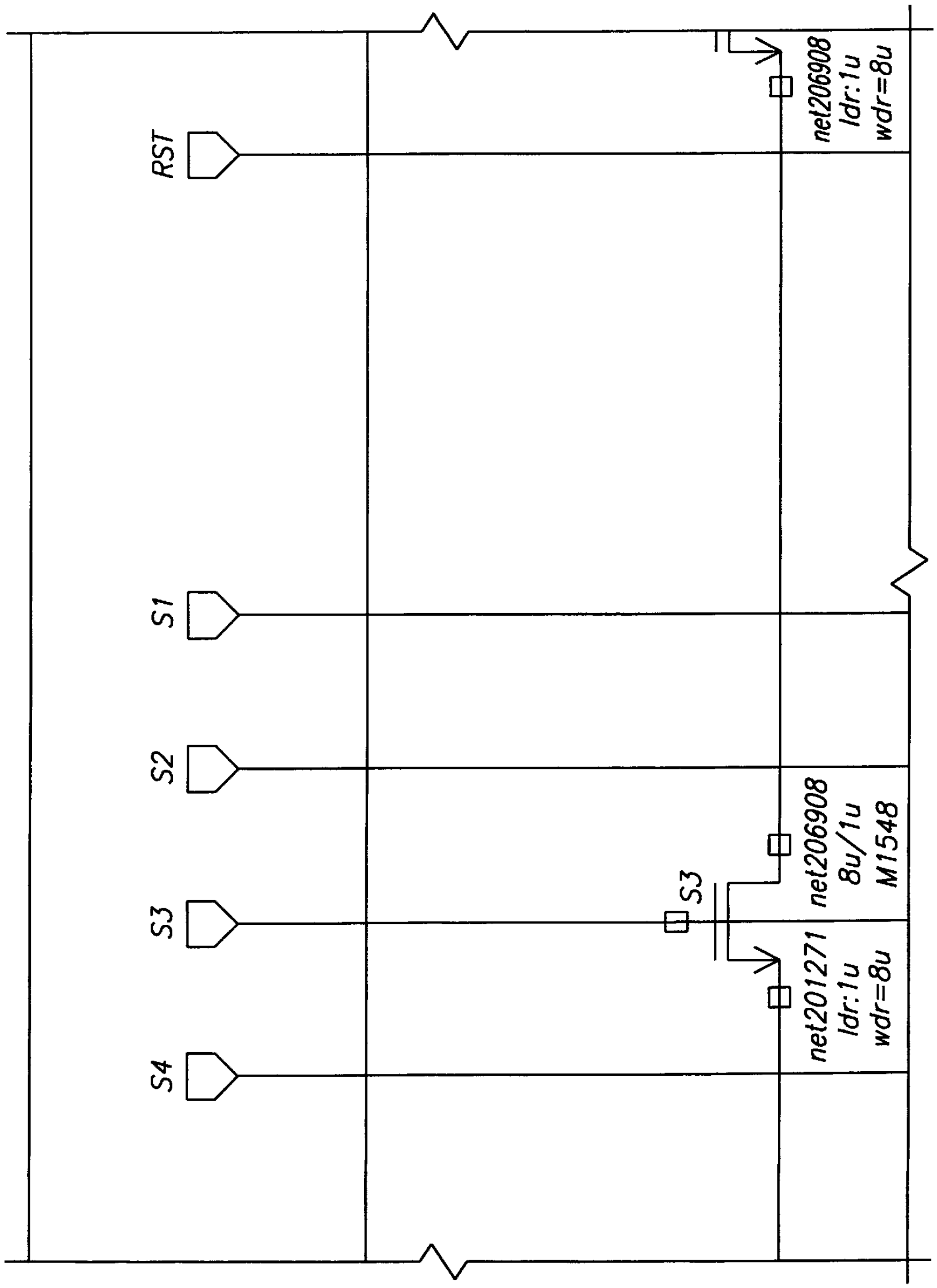
FIG. 7.0602AD

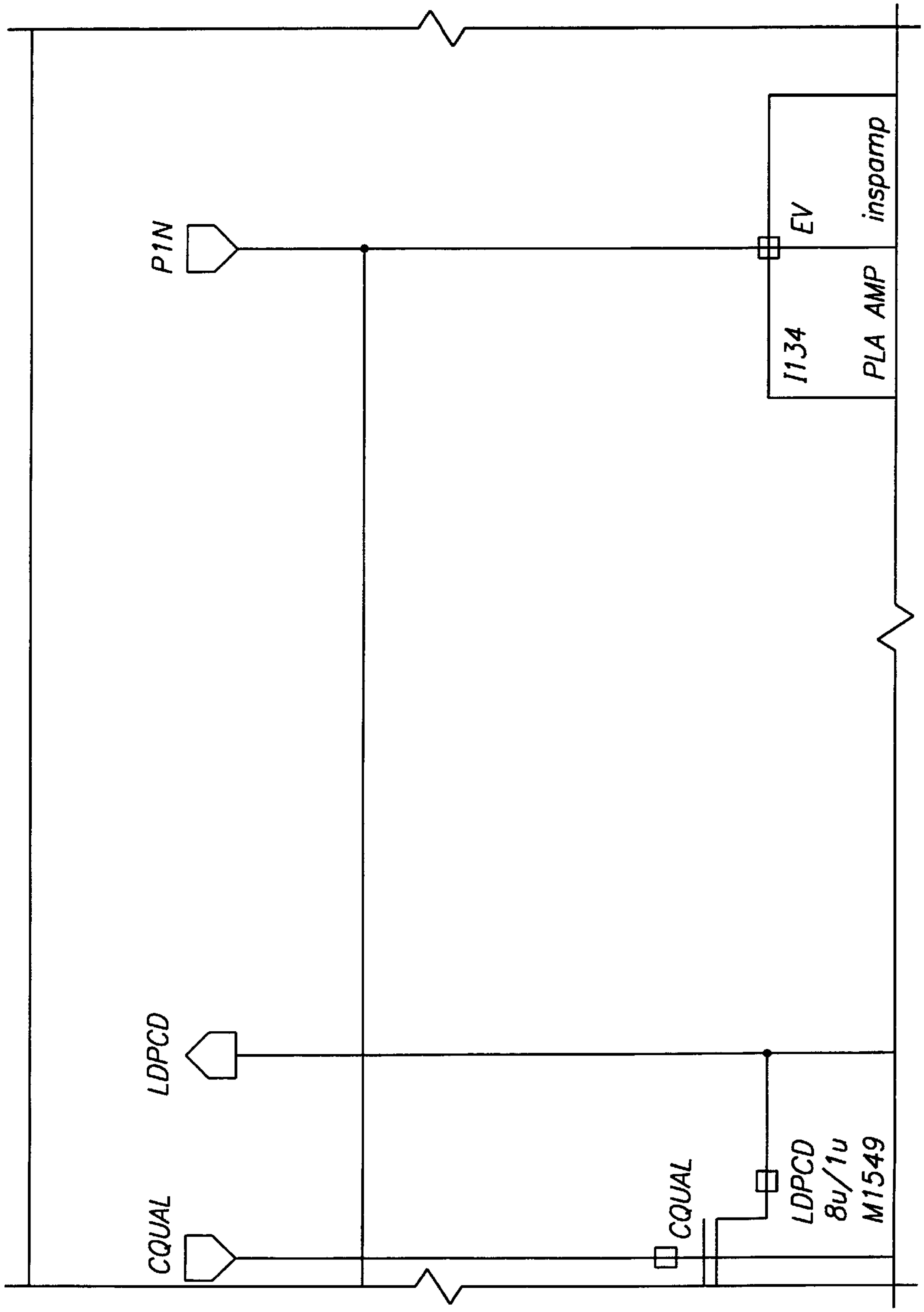
FIG. 7.060ZAE

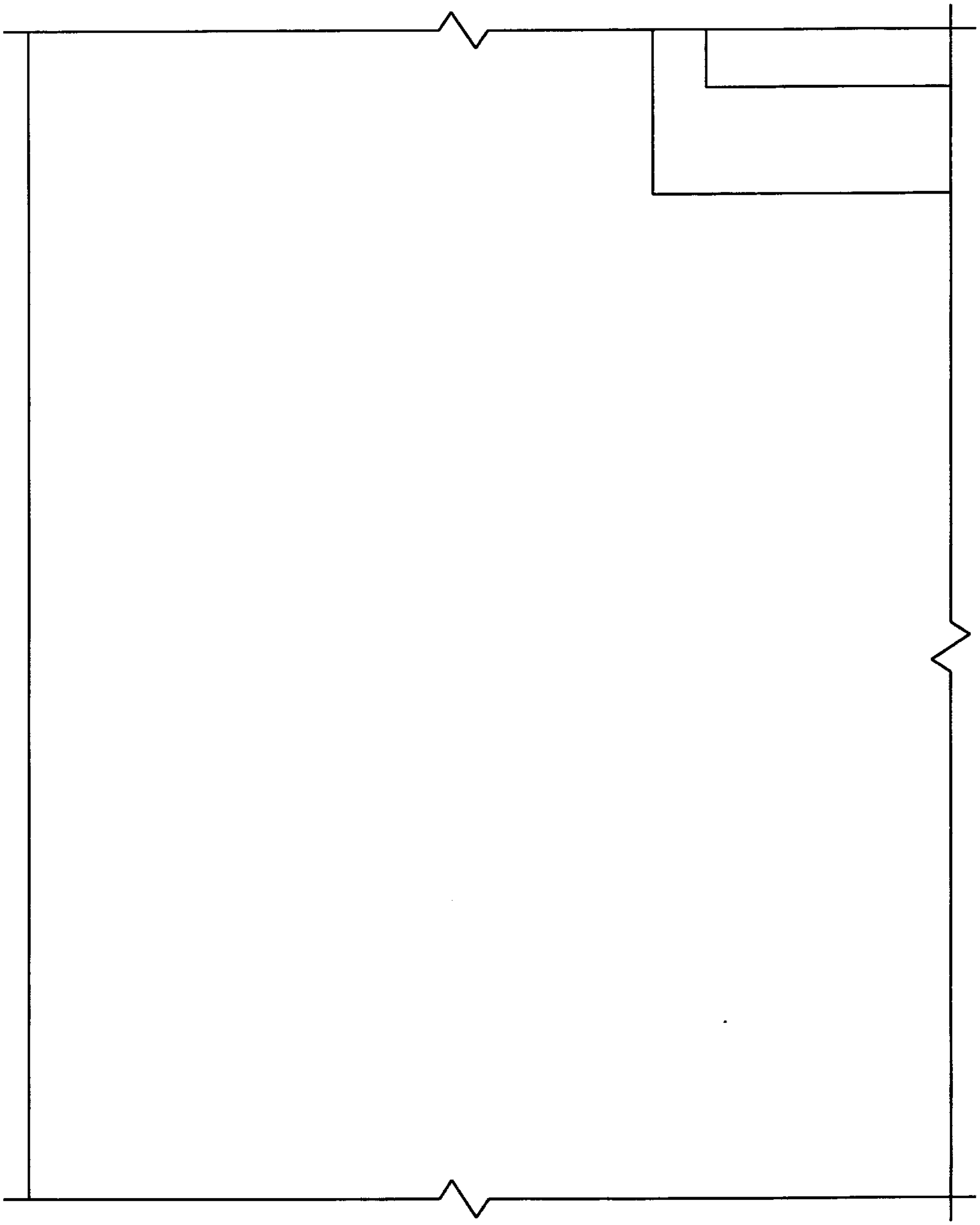
Fig 7.0602AF

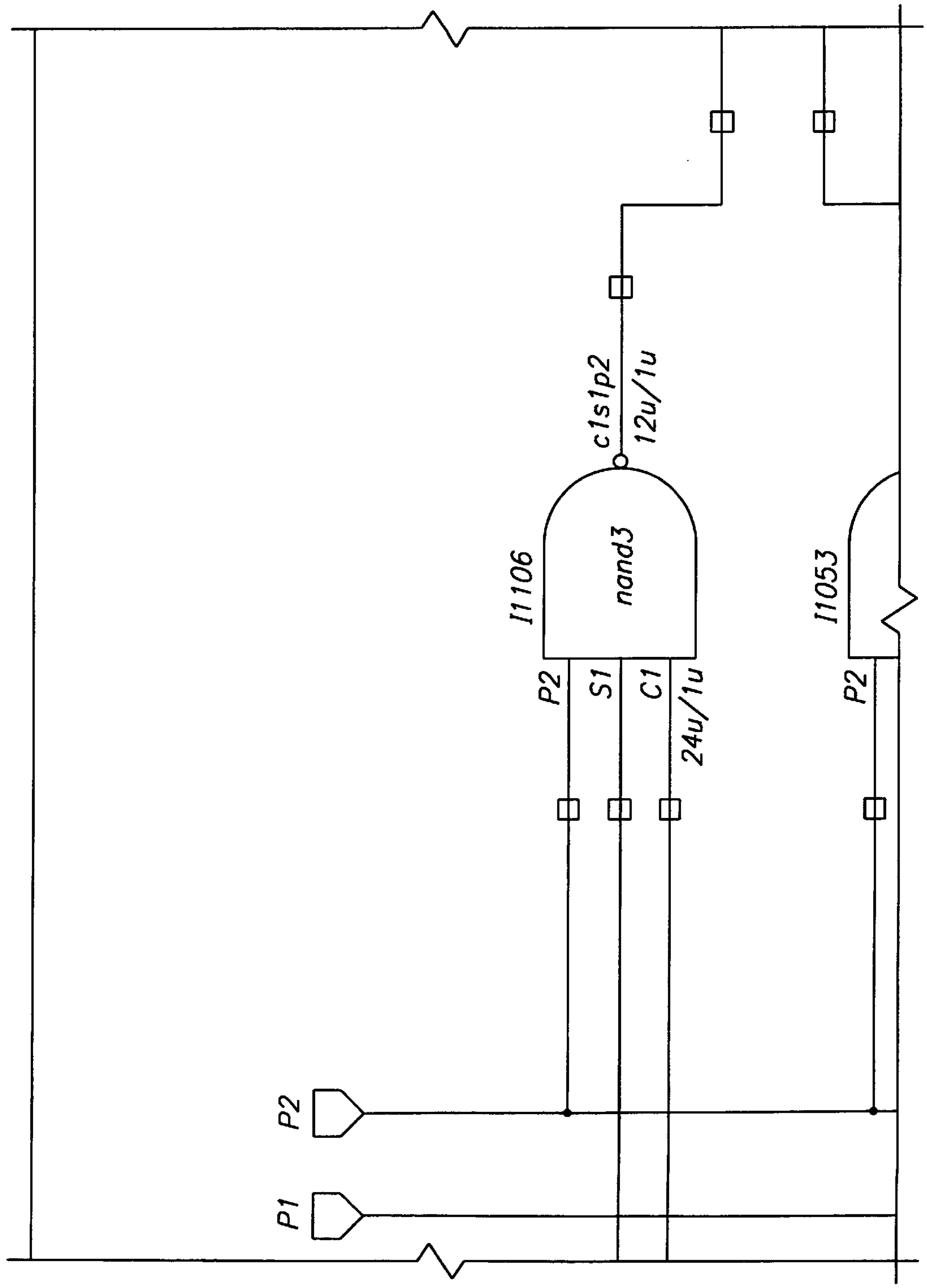
Fig. 7.0602AG

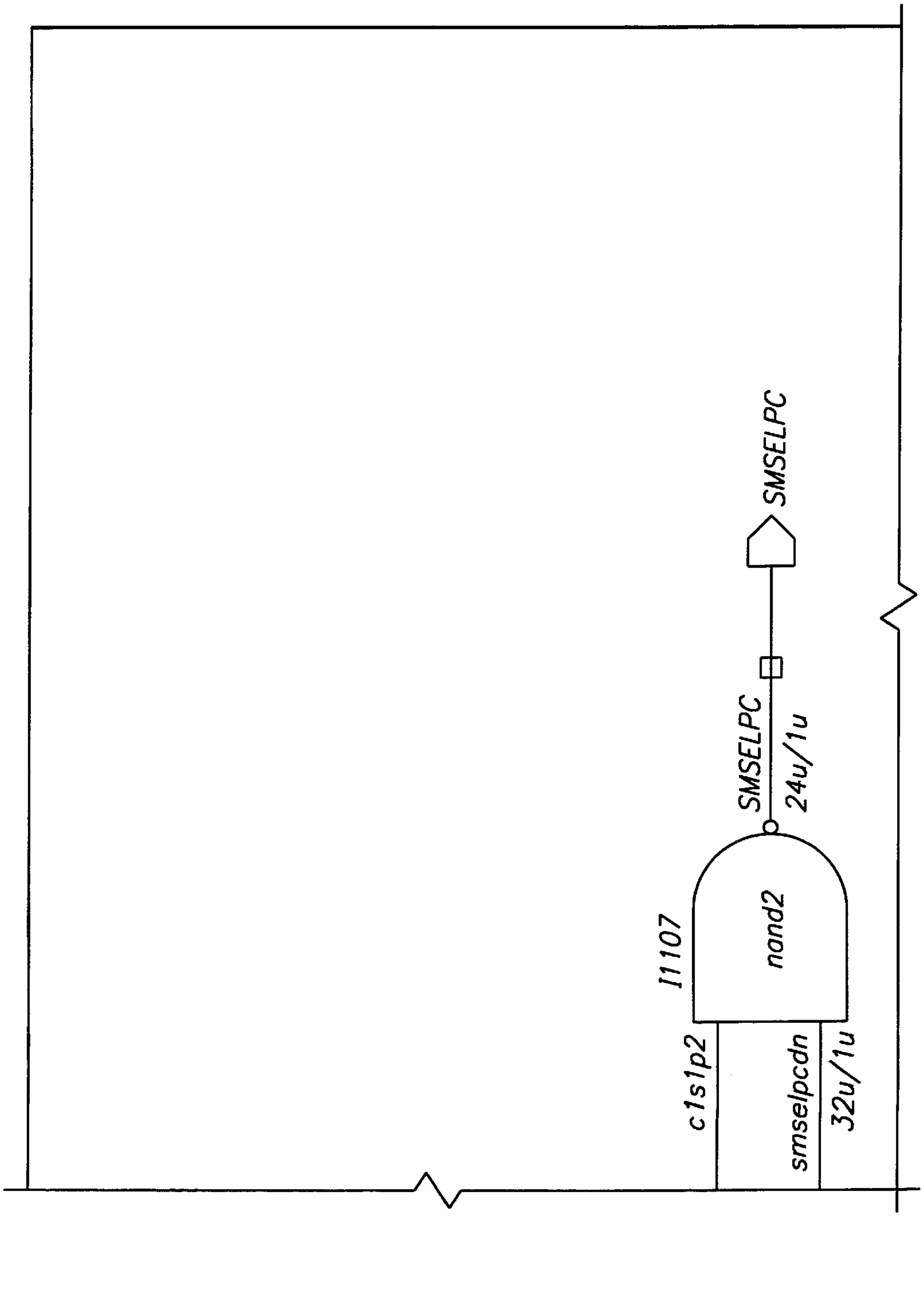
FIG. 7.00602AH

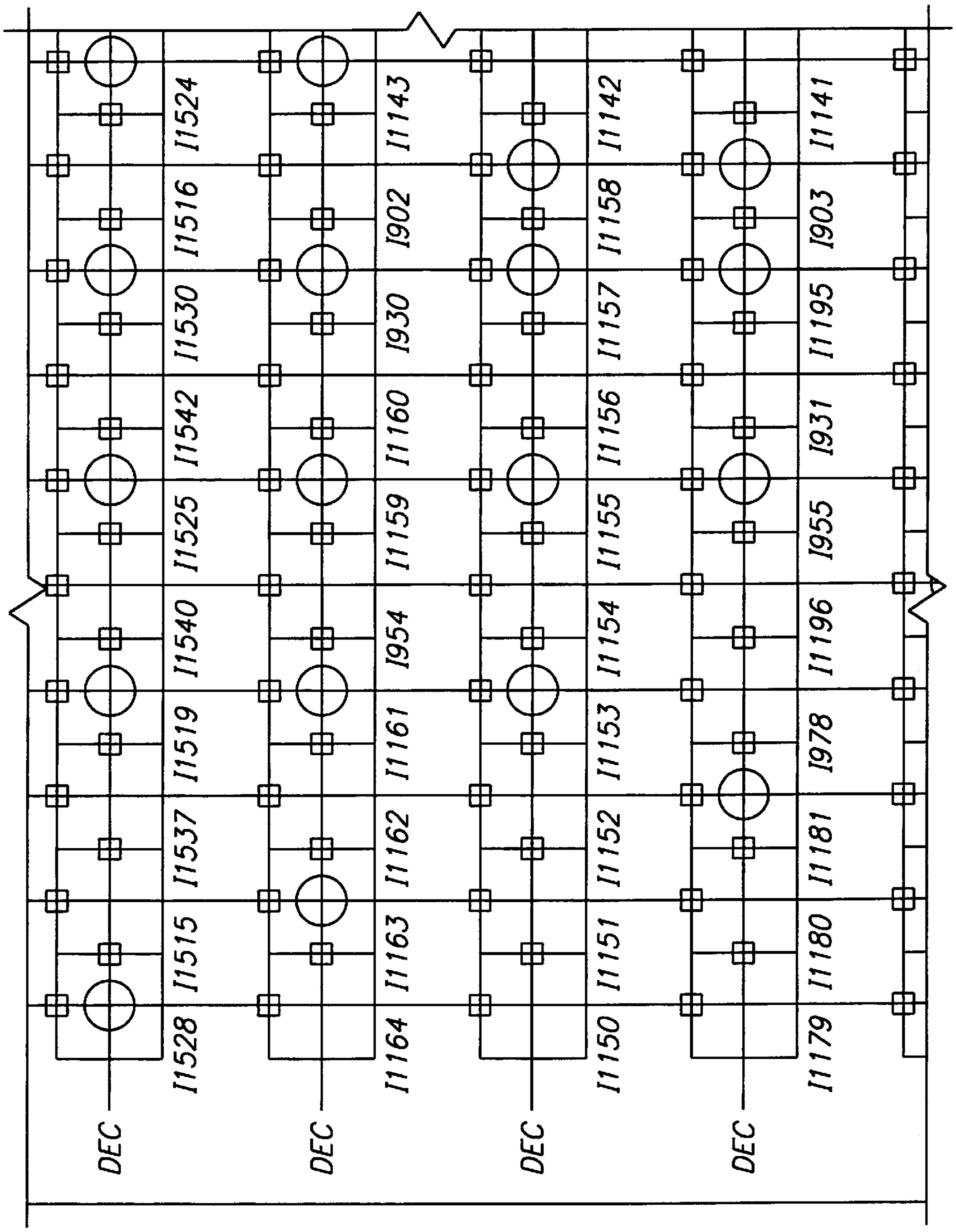
FIG 7.0602BA

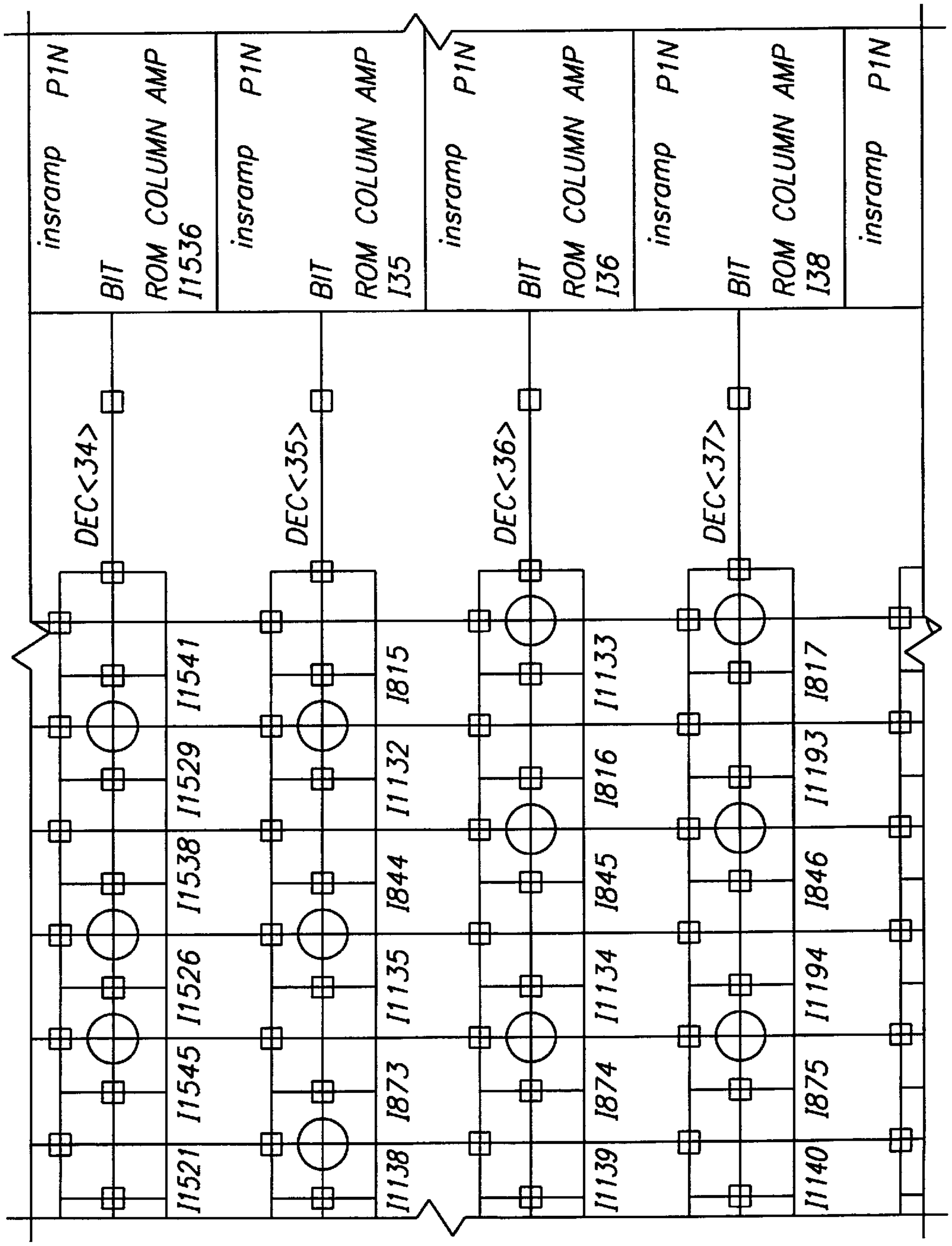
FIG 7.060.2BB

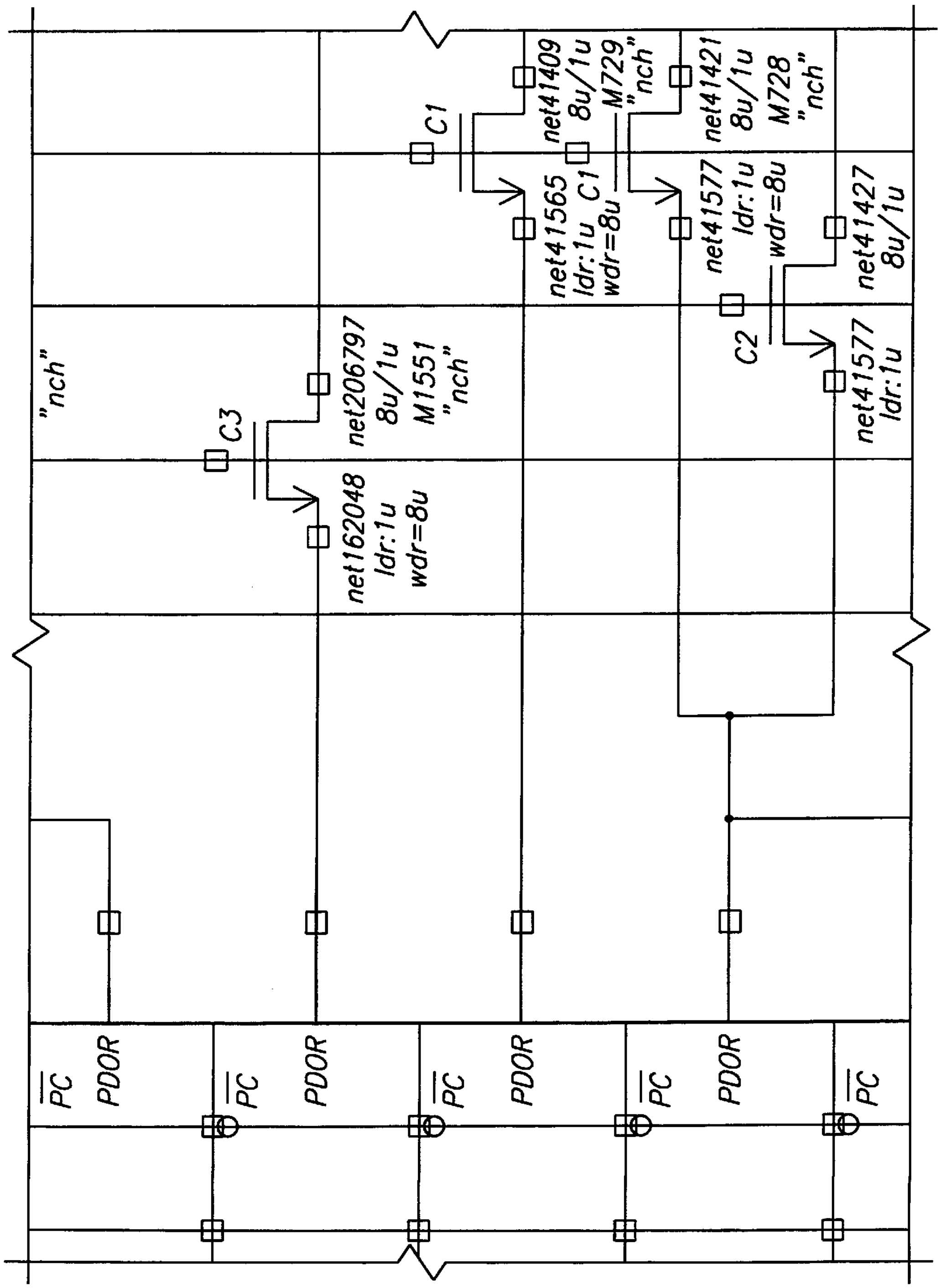
Fig. 7.0602BC

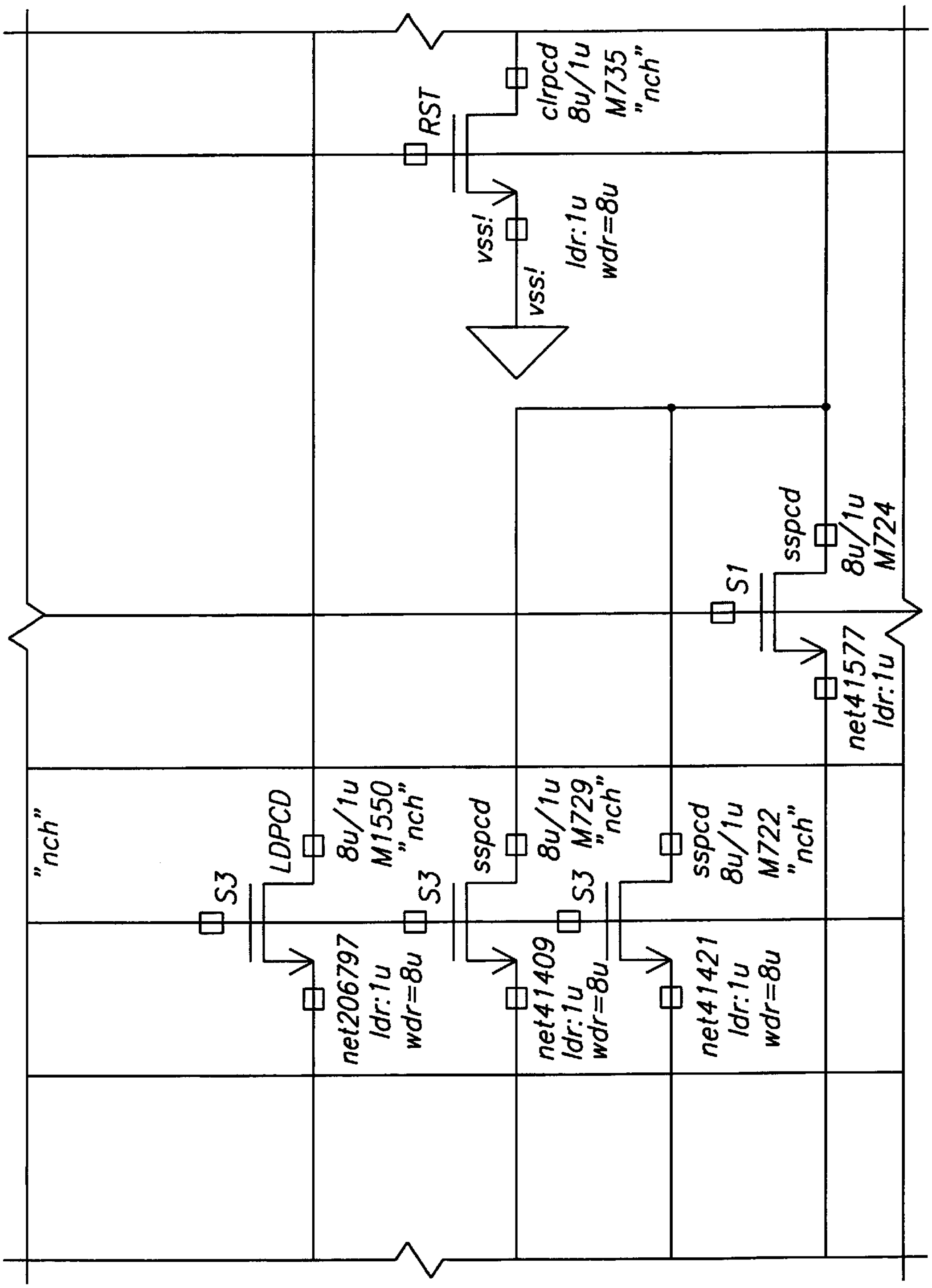
Fig. 1.0602BD

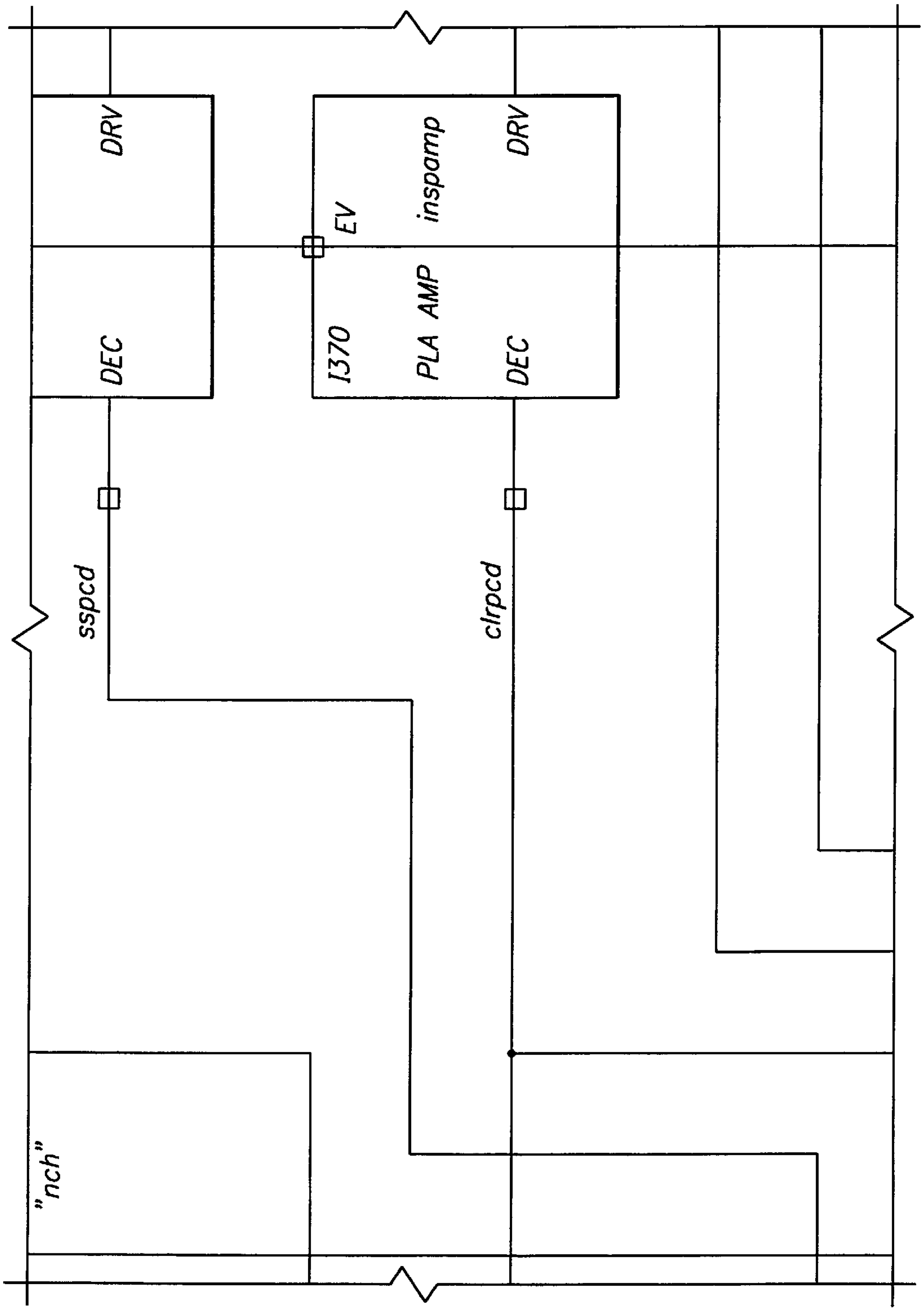
Fig 7.06G2BE

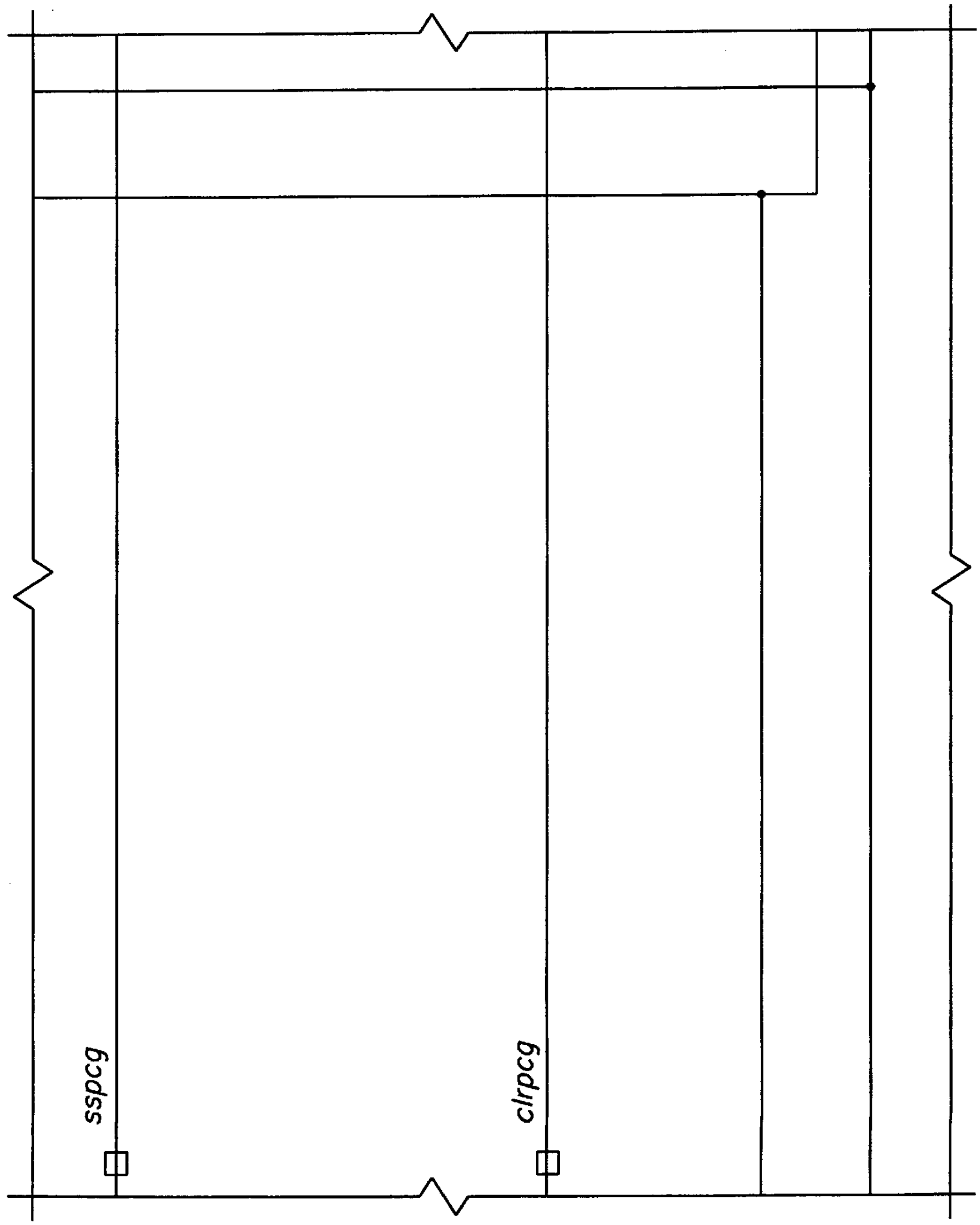
Fig. 7.0602BF

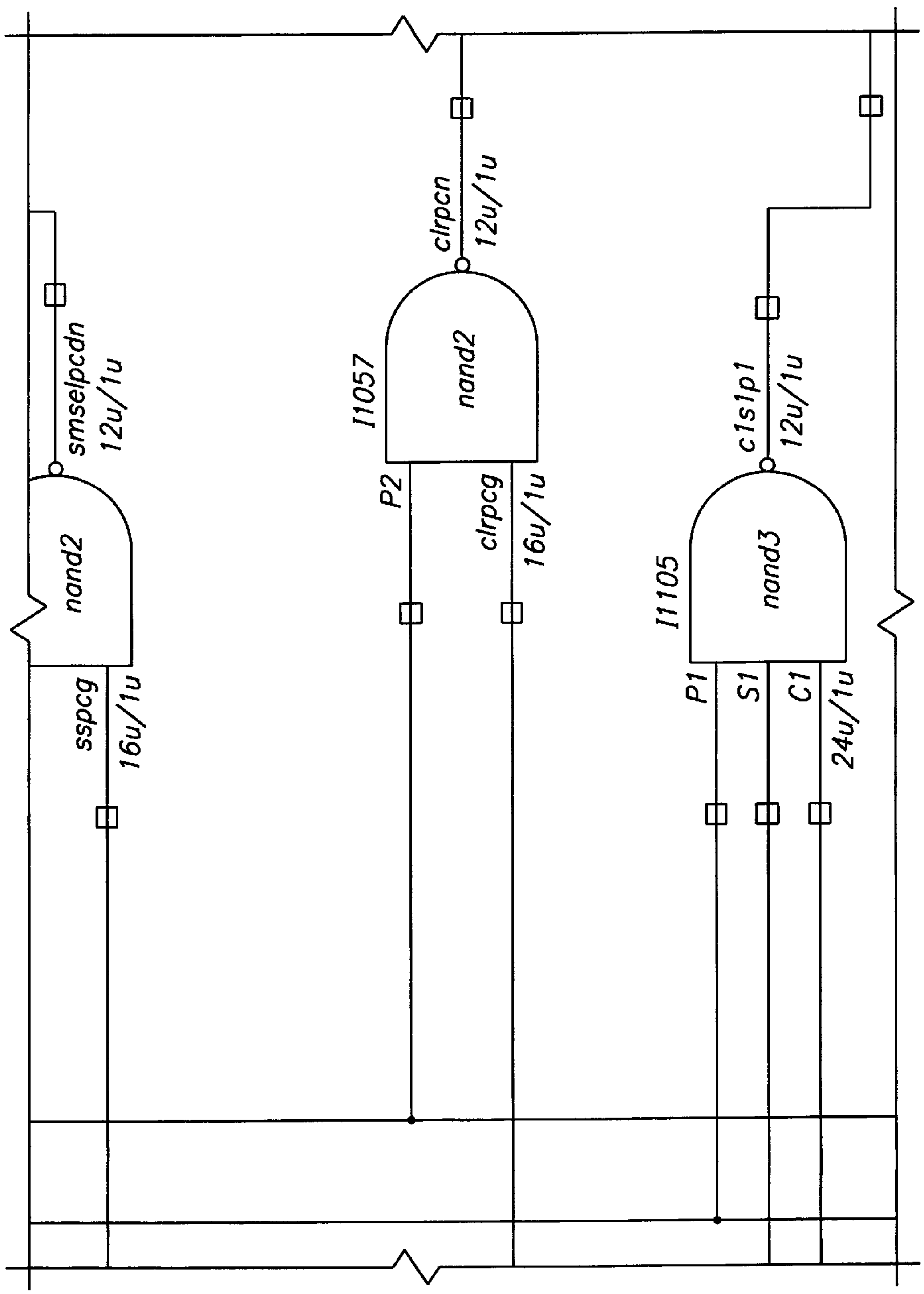
Fig. 1.0602BG

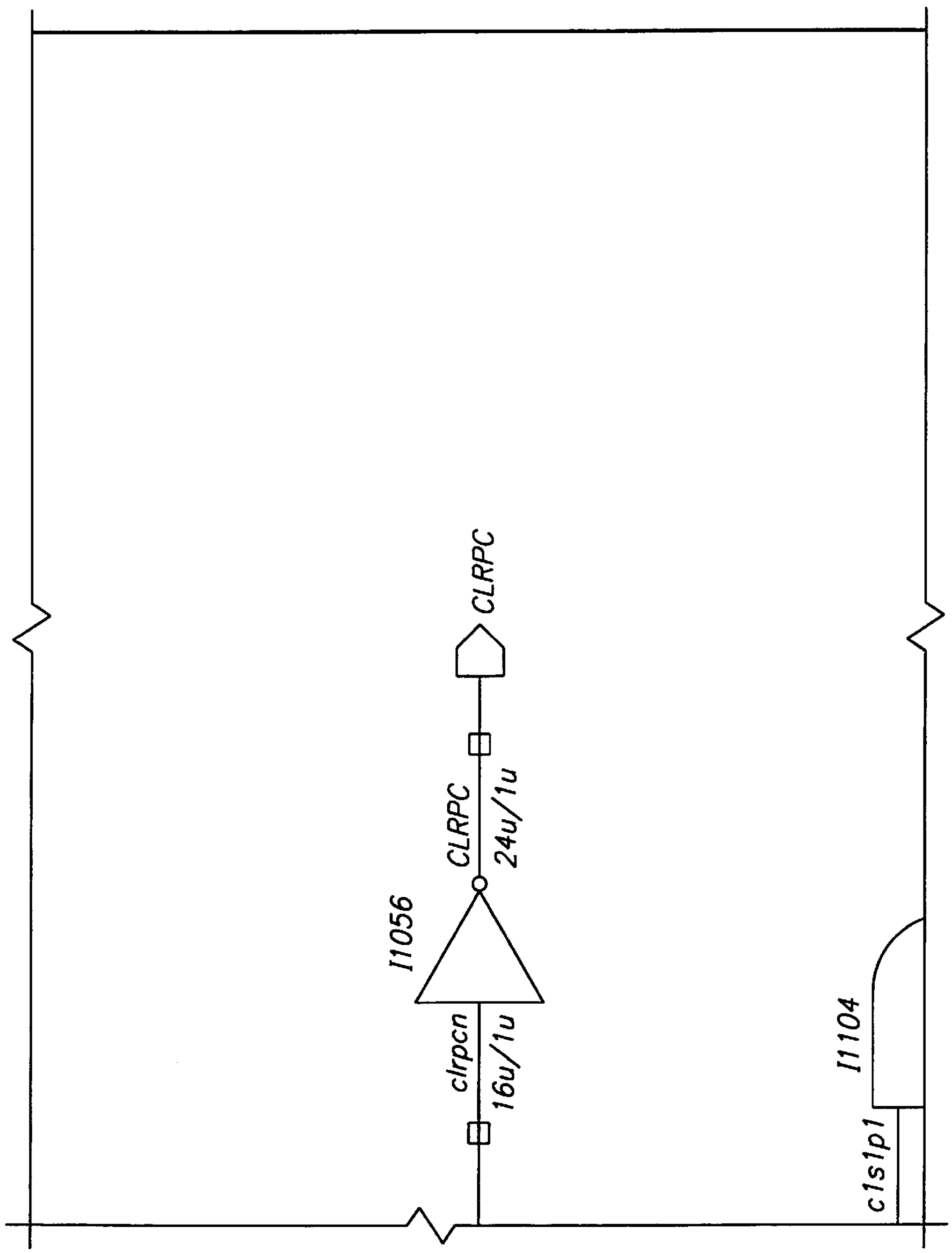
Fig. 7.0602BH

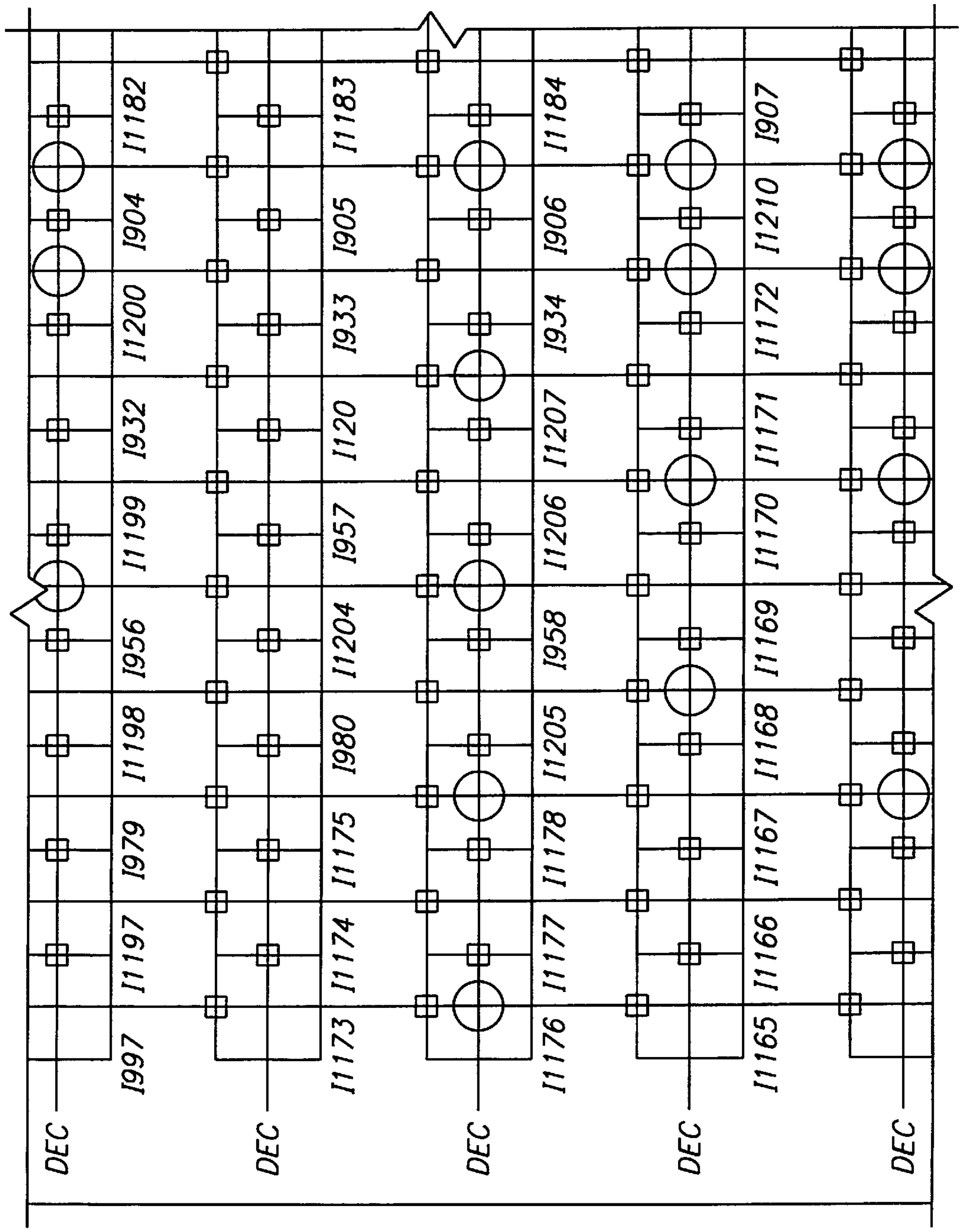
Fig 7.0602CA

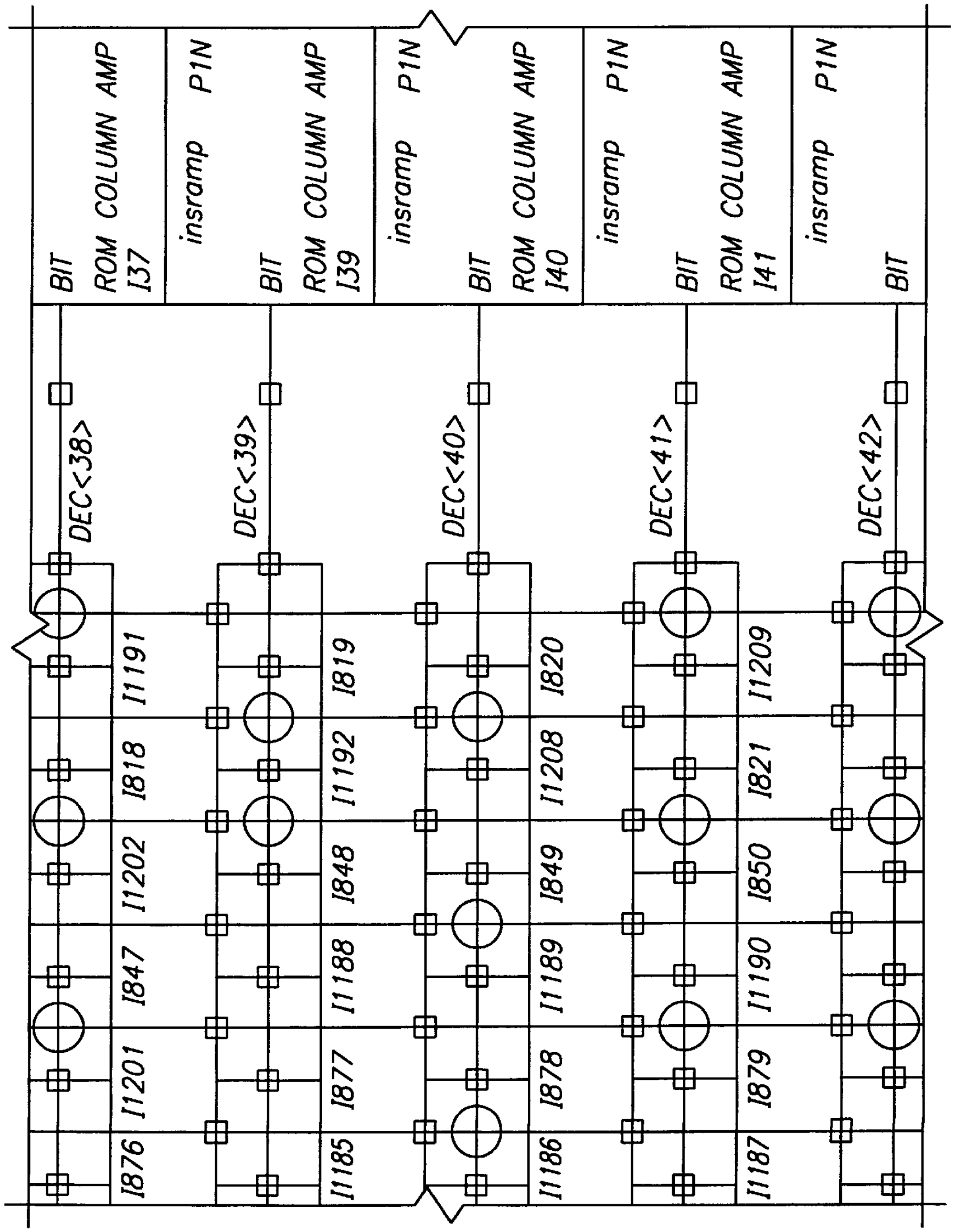
FIG. 1.0602CB

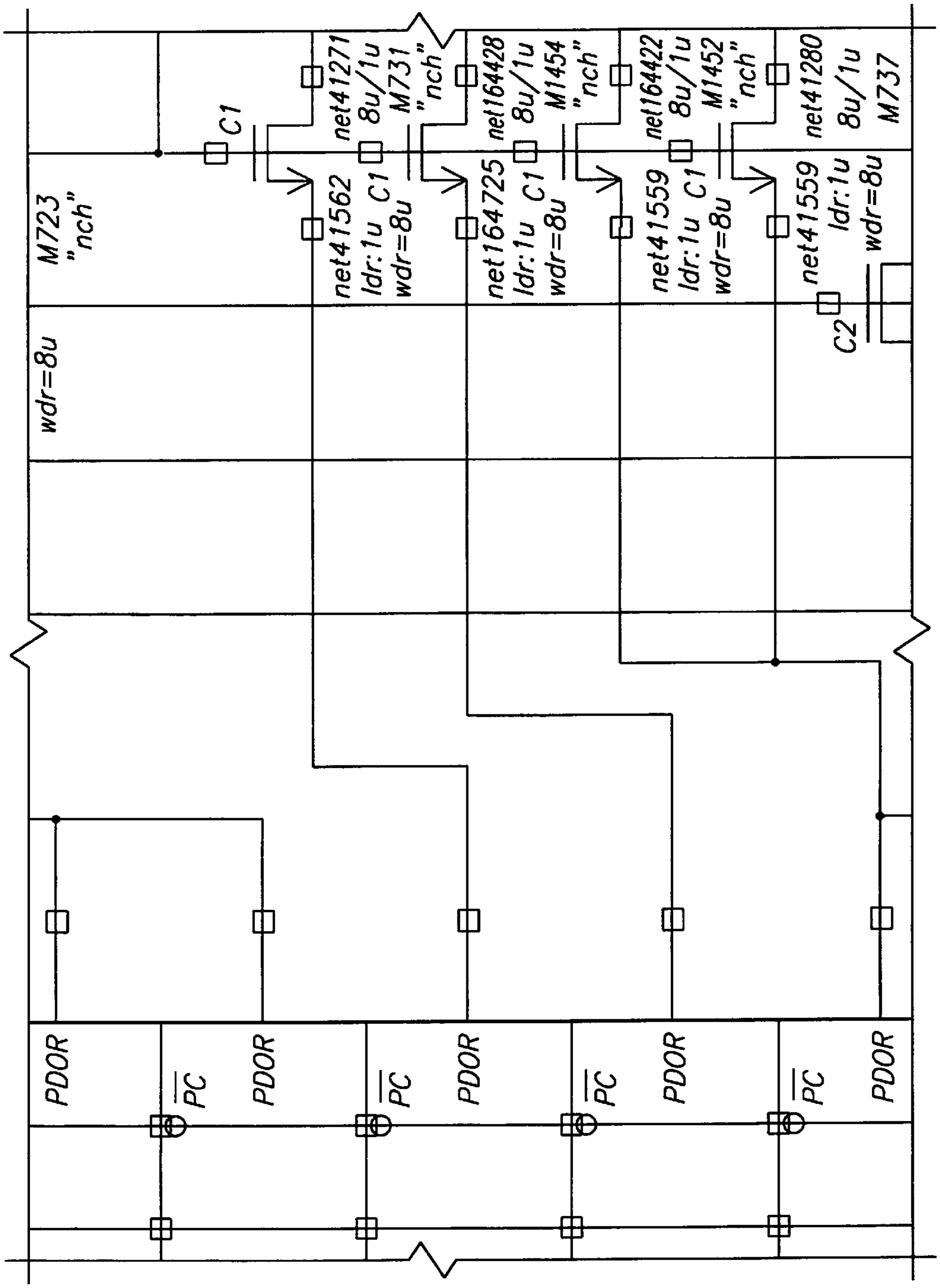
Fig 7.060ZCC

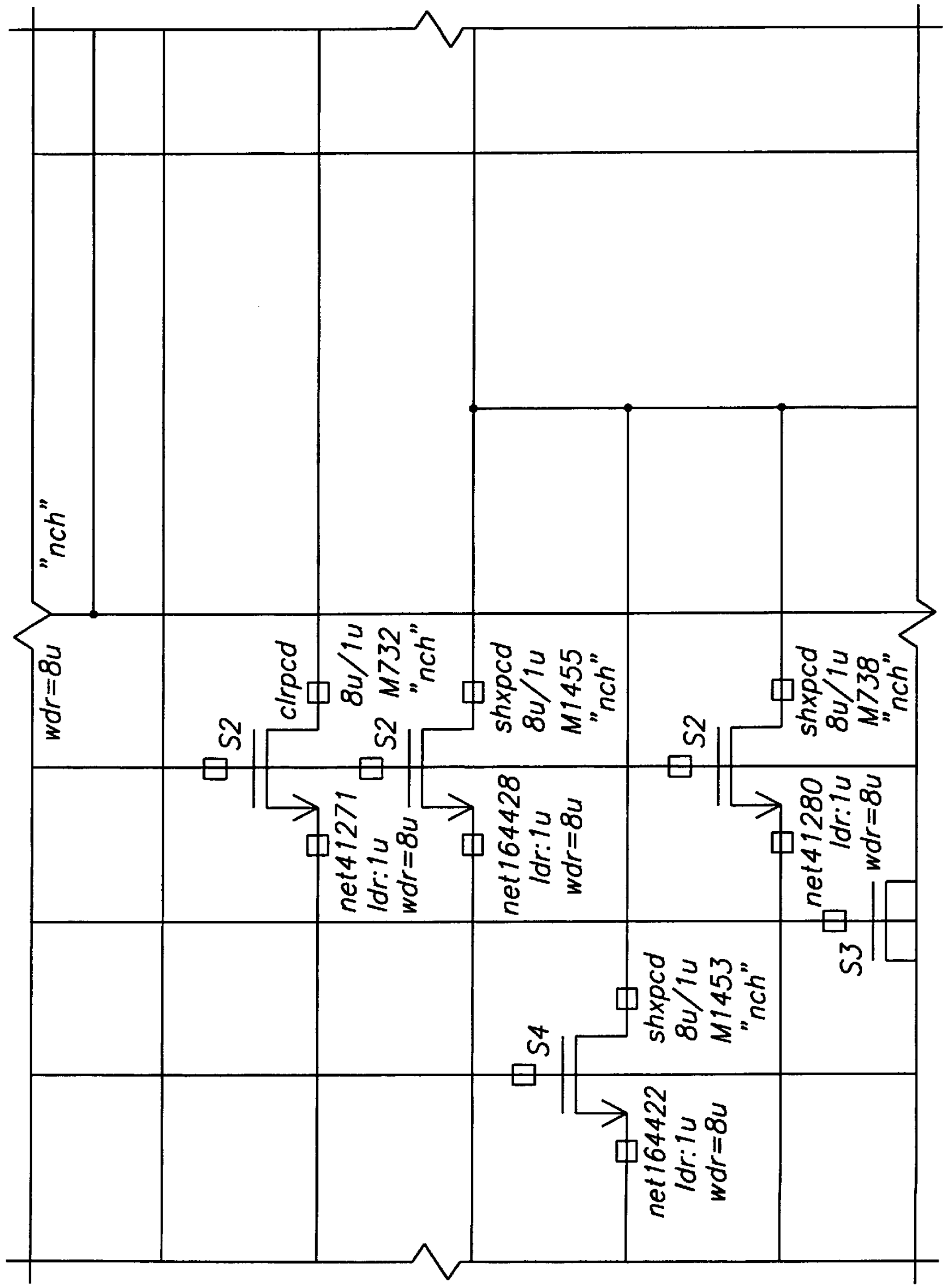
FIG. 1.060C2D

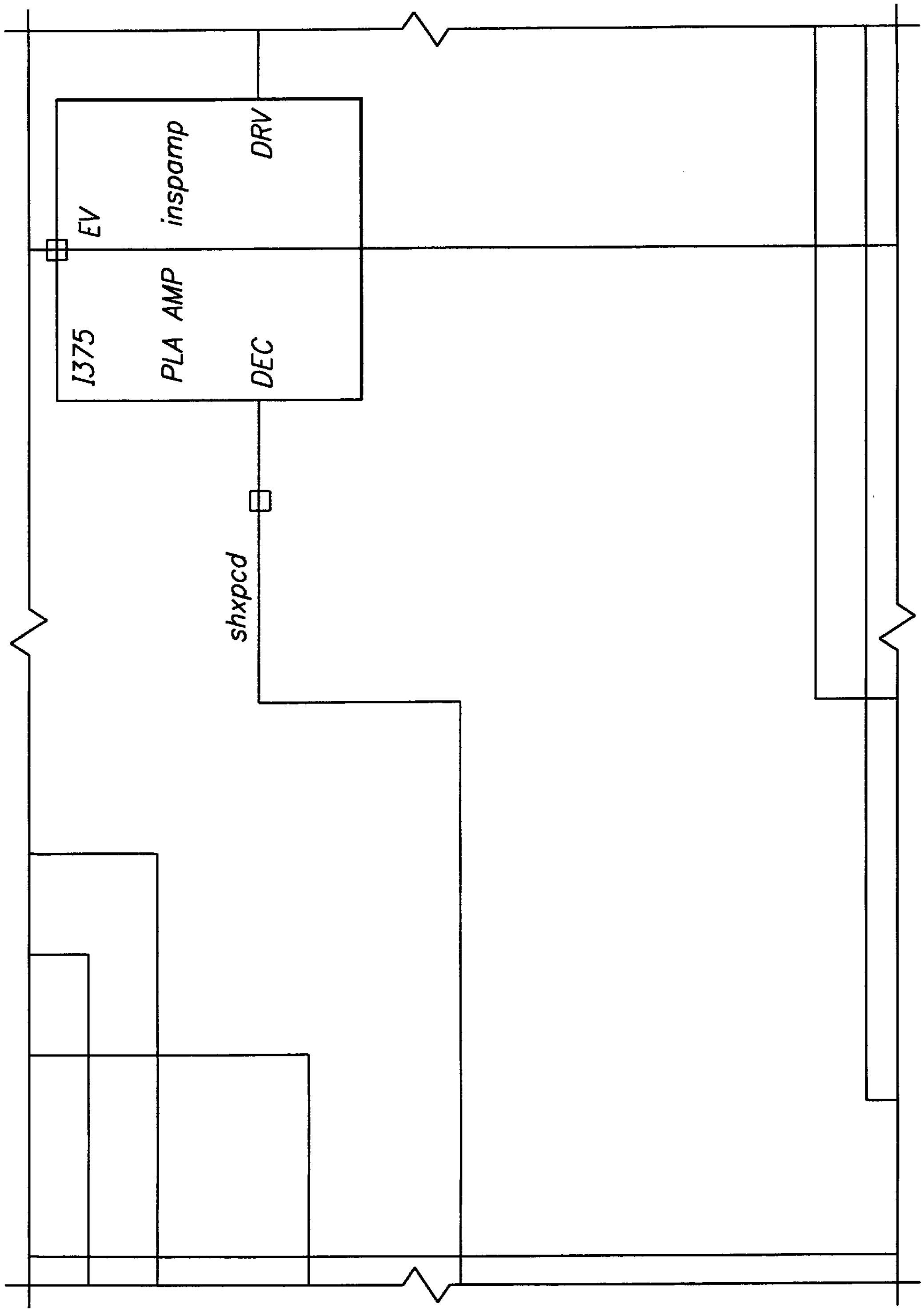
Fig 7.060.2CE

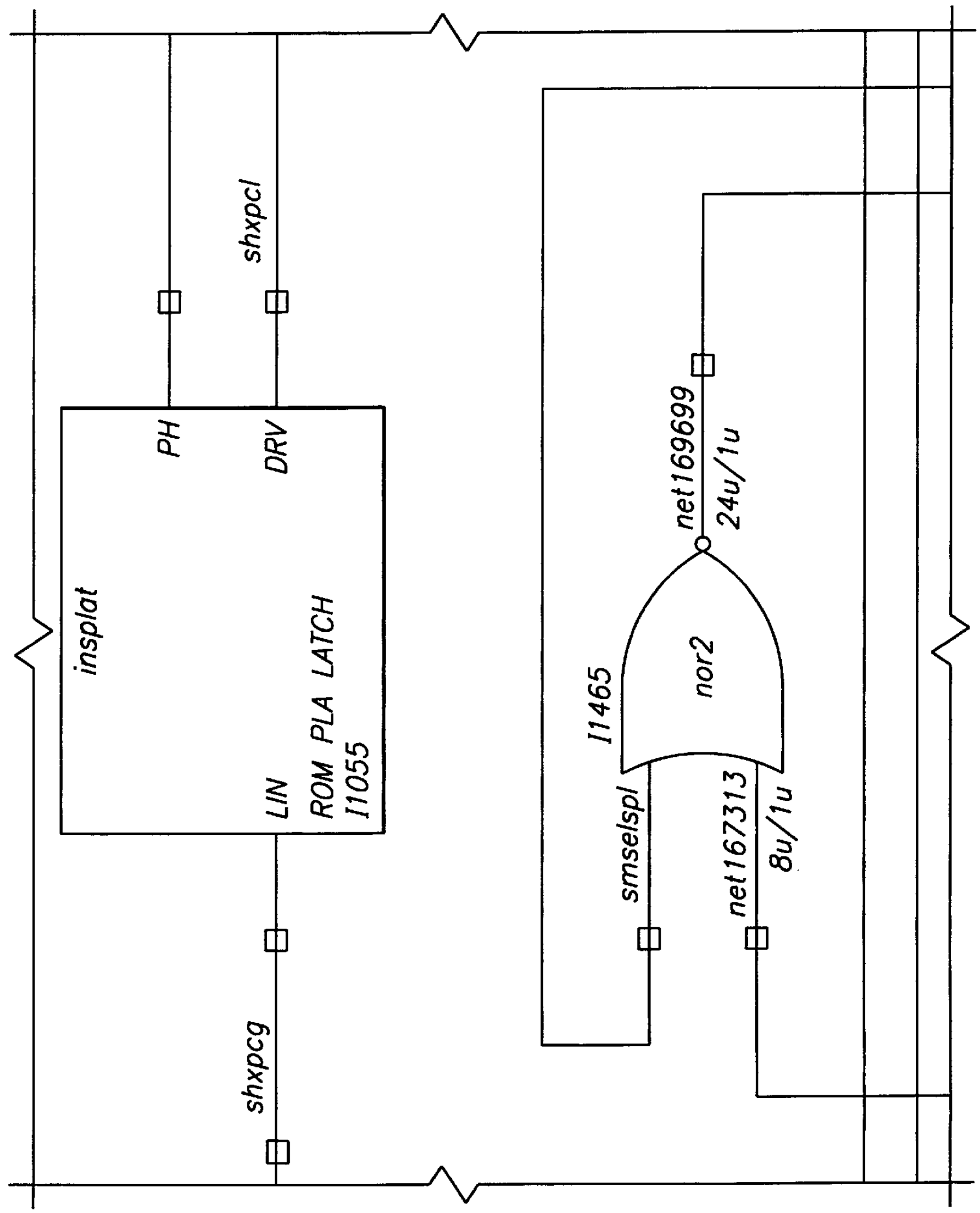
Fig. 7.060.2CF

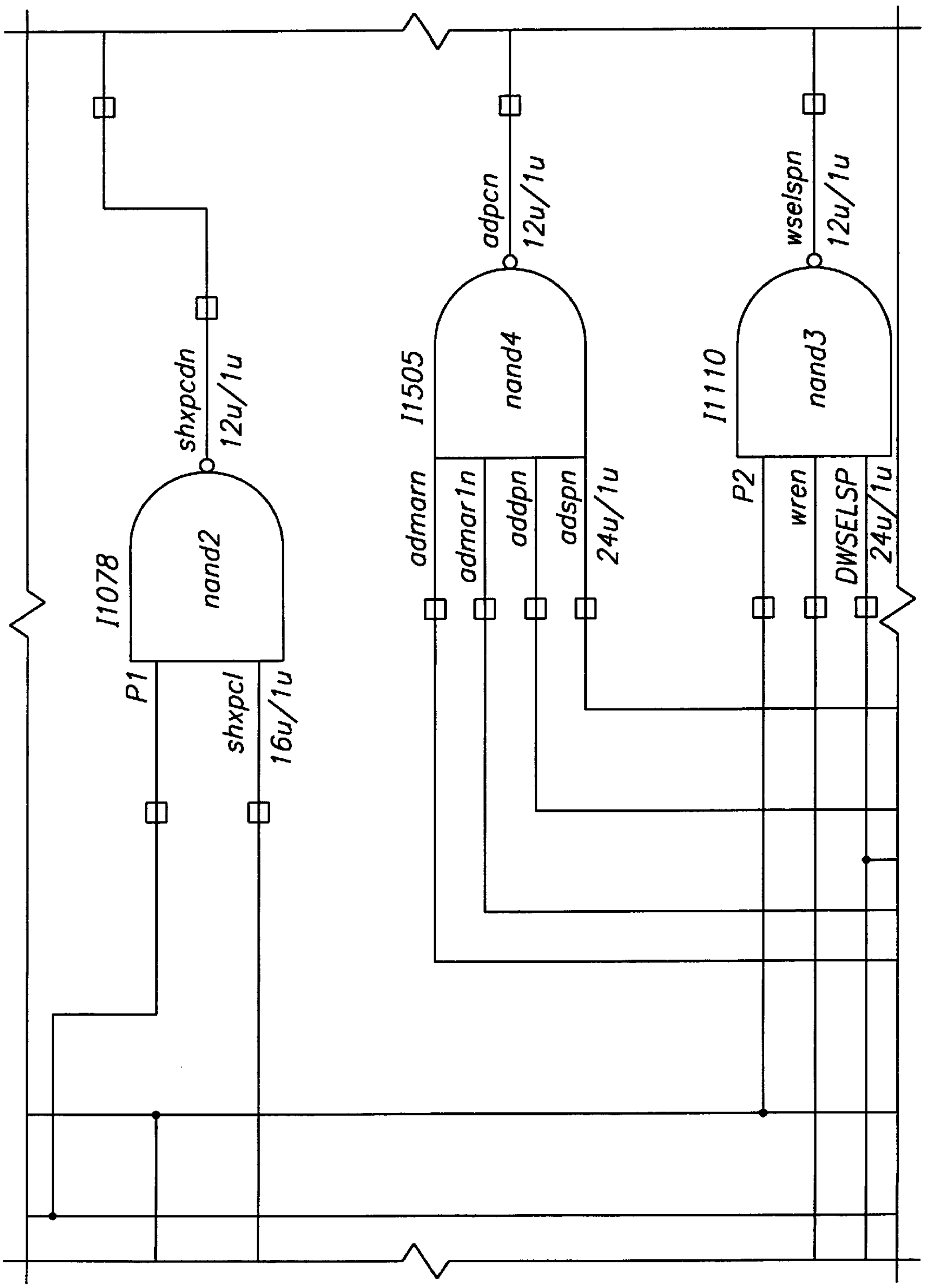
FIG. 7.0602CG

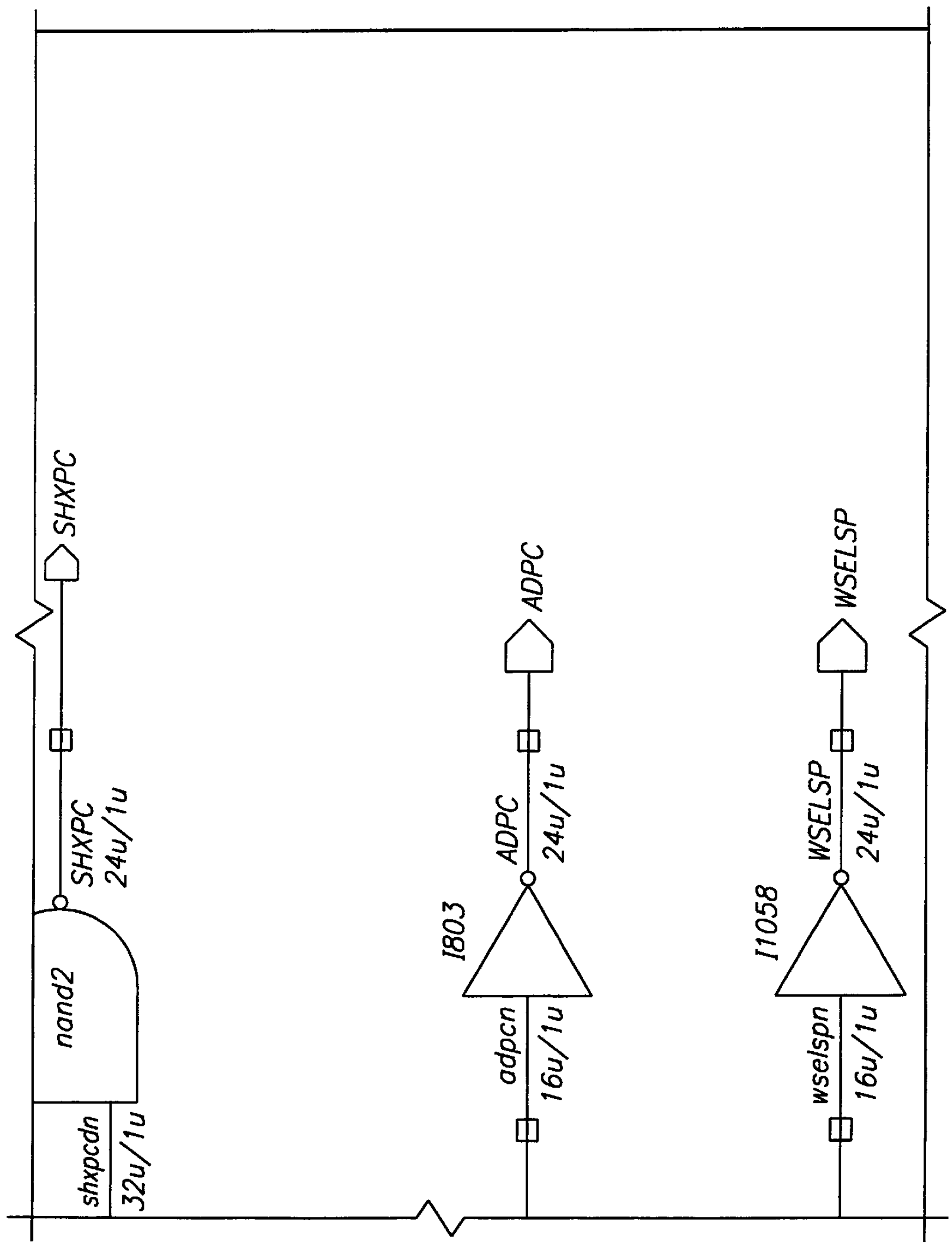
FIG. 7.00602CH

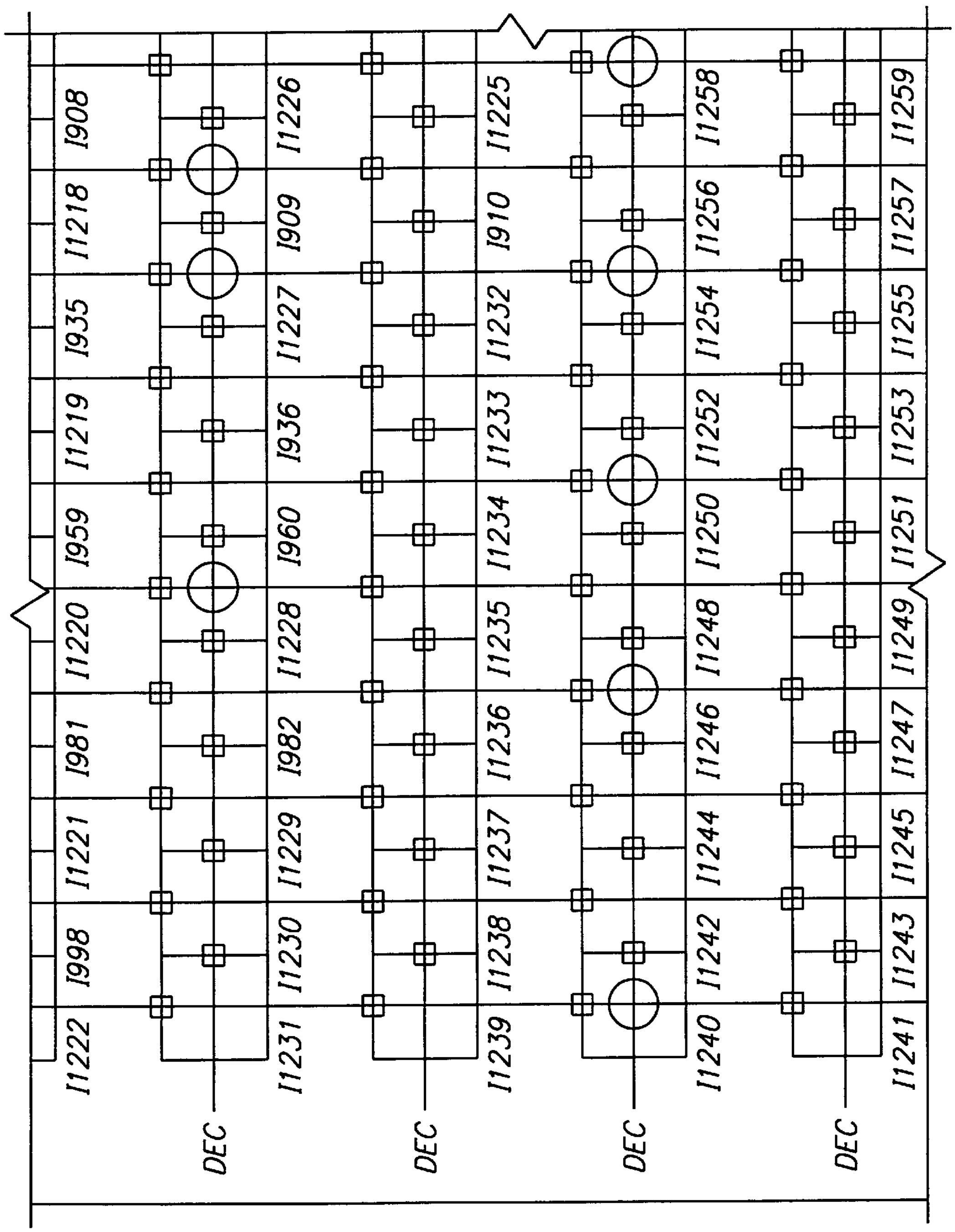
FIG. 7.0602DA

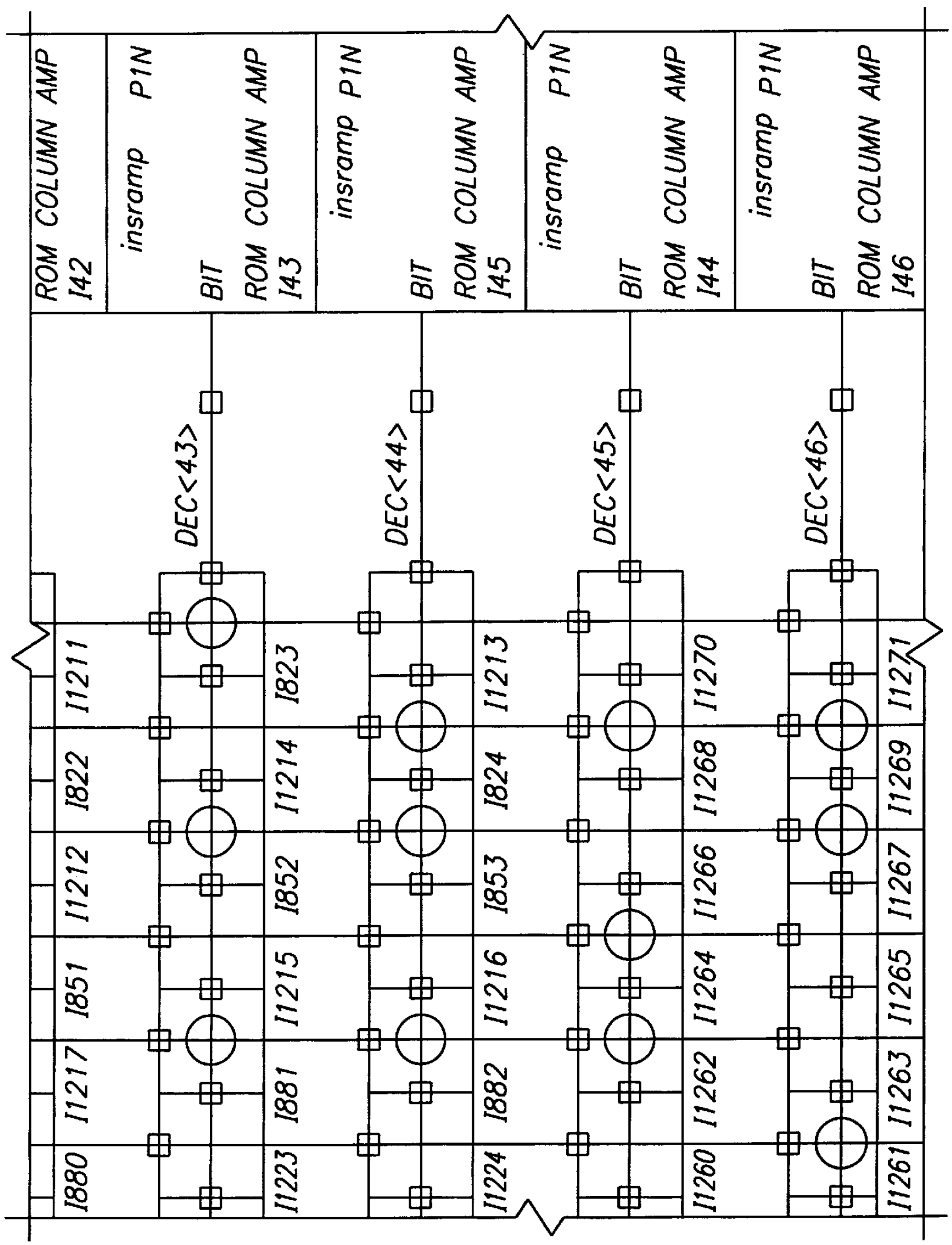
FIG. 7.0602DB

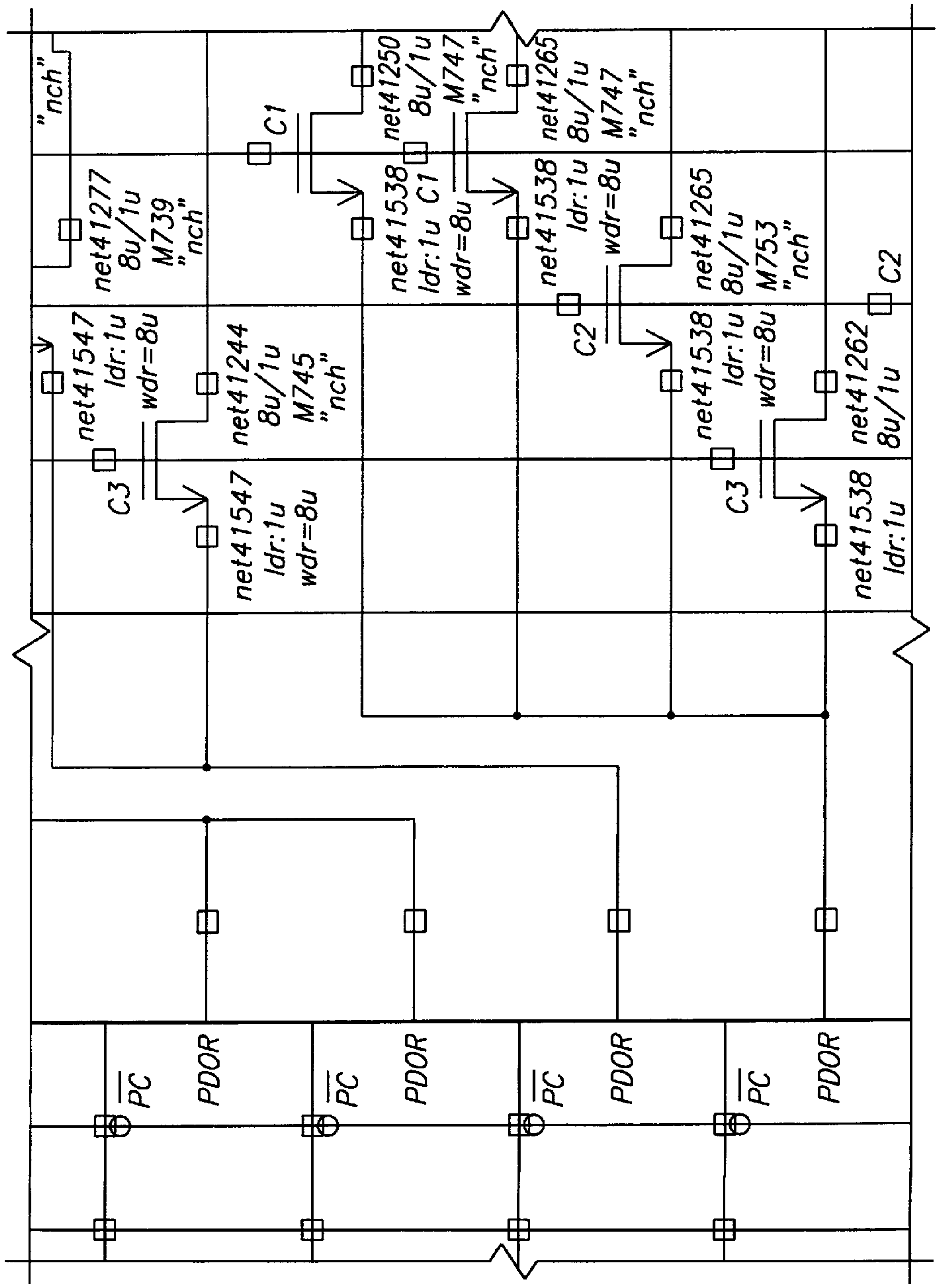
"nch"
net41277 8u/1u M739 "nch"
C1
net41250 8u/1u M747 "nch"
net41265 8u/1u M747 "nch"
net41538 ldr:1u C1 wdr=8u
net41538 ldr:1u wdr=8u
net41265 8u/1u M753 "nch"
C2
net41547 ldr:1u wdr=8u
net41244 8u/1u M745 "nch"
C2
net41538 ldr:1u wdr=8u
net41262 8u/1u
C3
net41547 ldr:1u wdr=8u
C3
net41538 ldr:1u
PC
PDOR
PC
PDOR
PC
PDOR
PC
PDOR

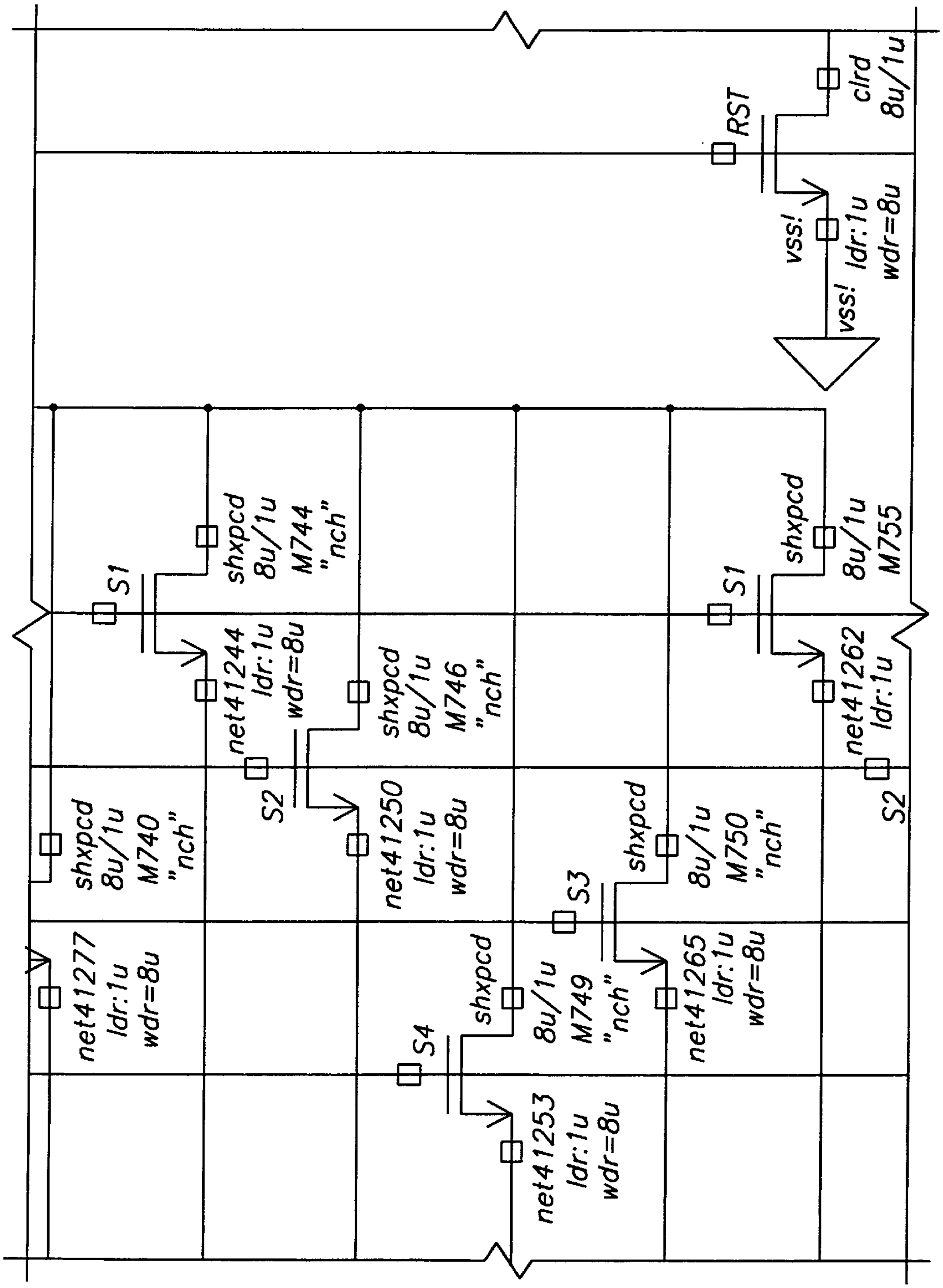
Fig. 7.0602DD

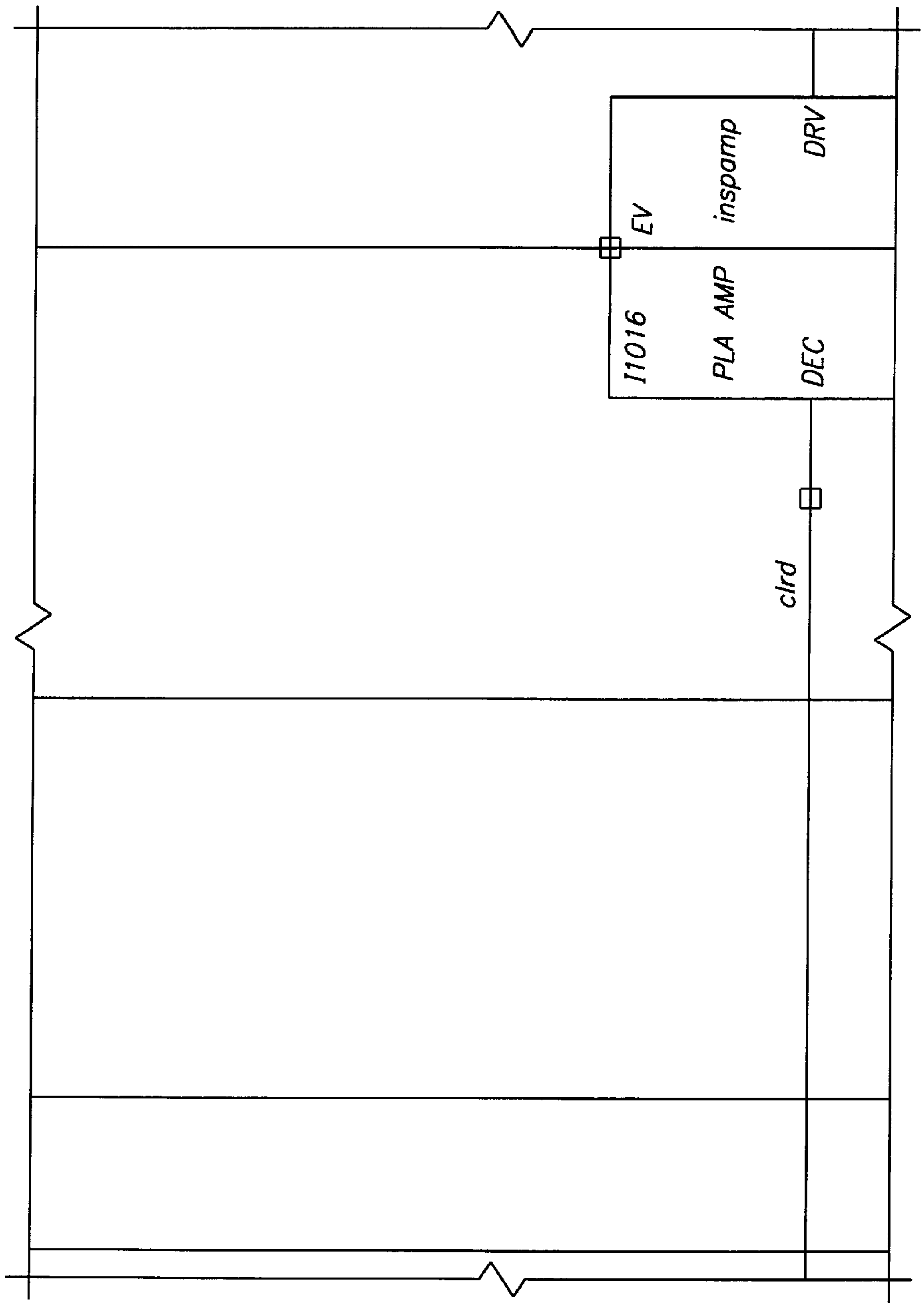
Fig 7.0602DE

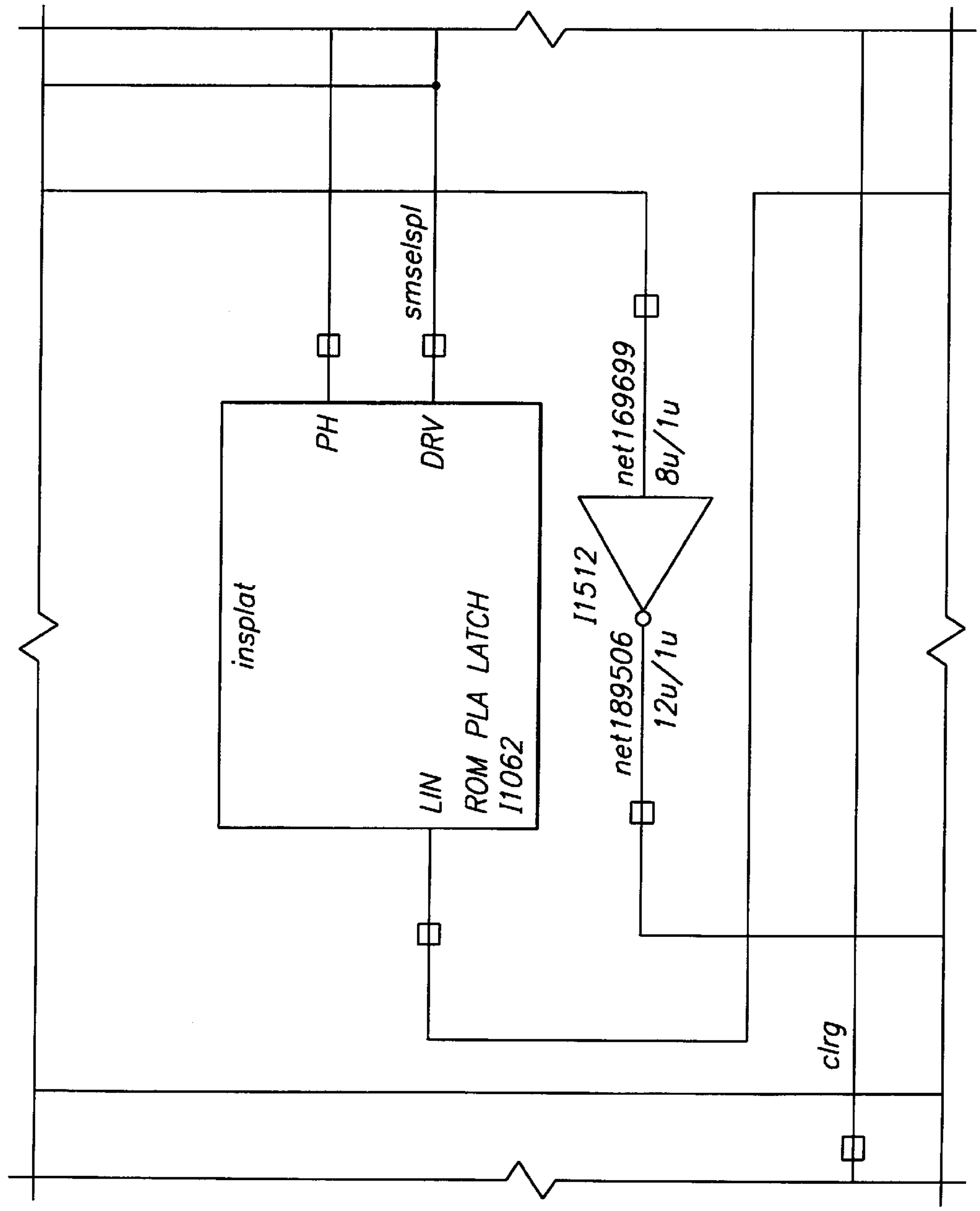
Fig 7.060.2DF

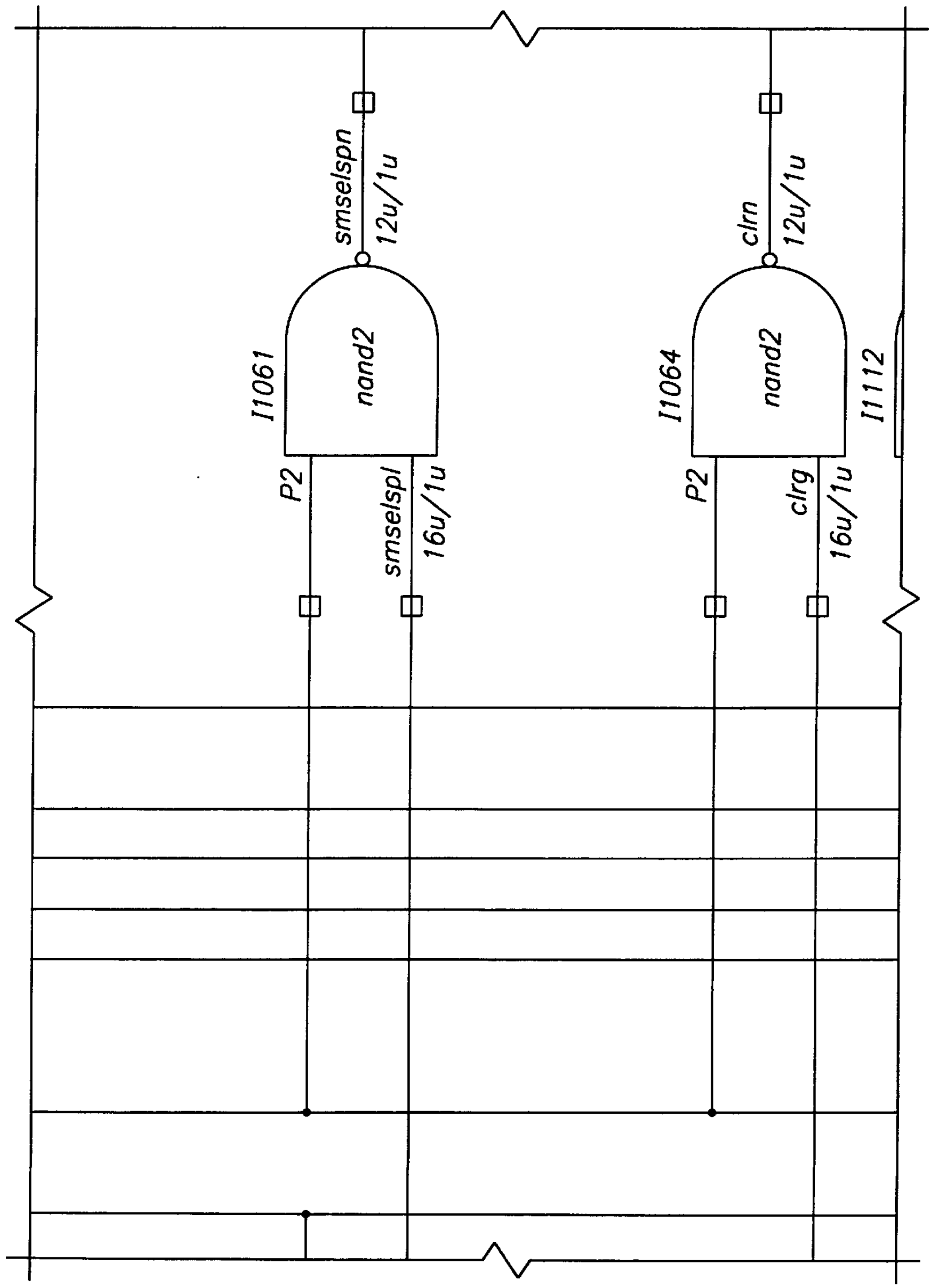
FIG. 1.060206

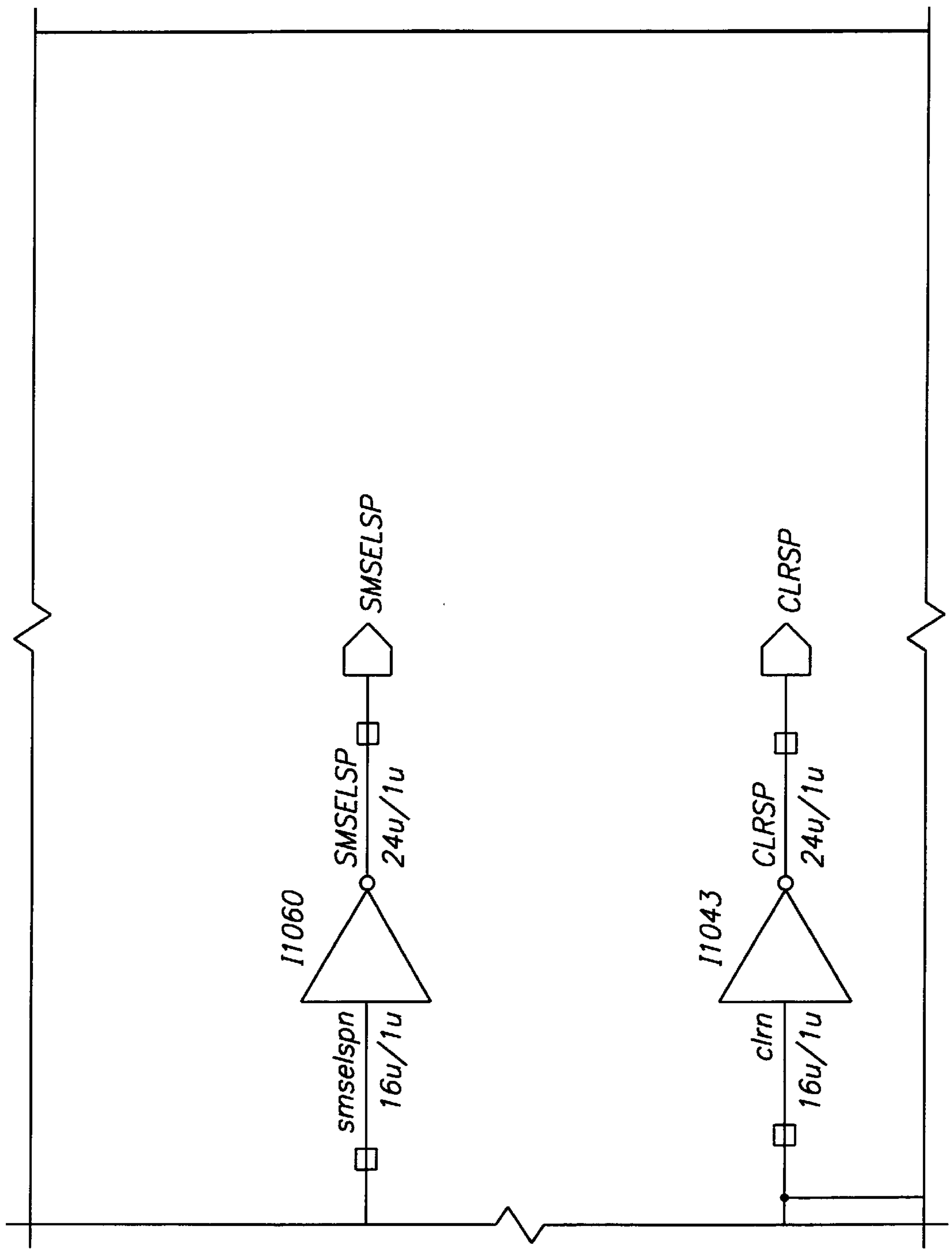
Fig. 7.06020H

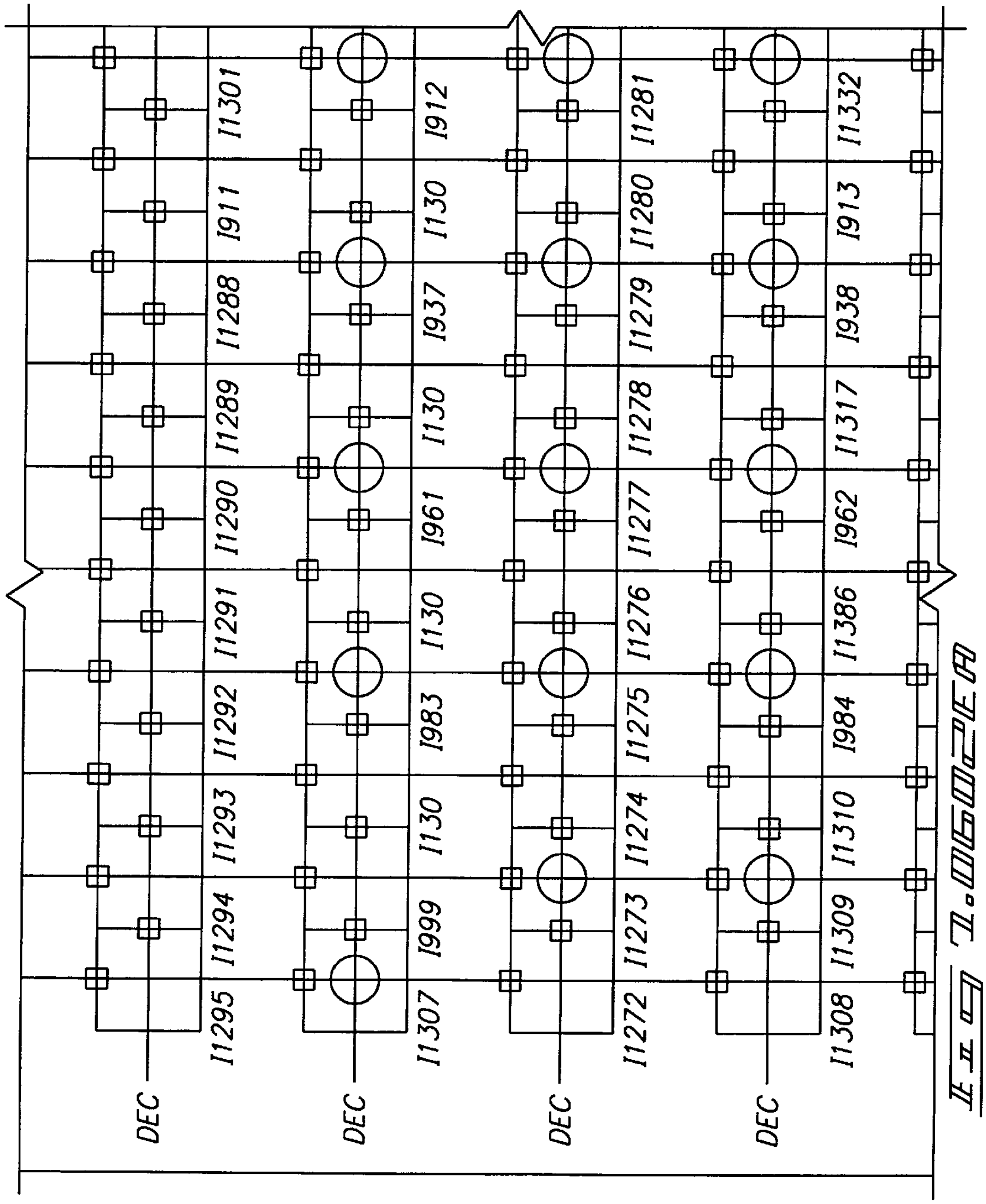
FIG. 7.0602EA

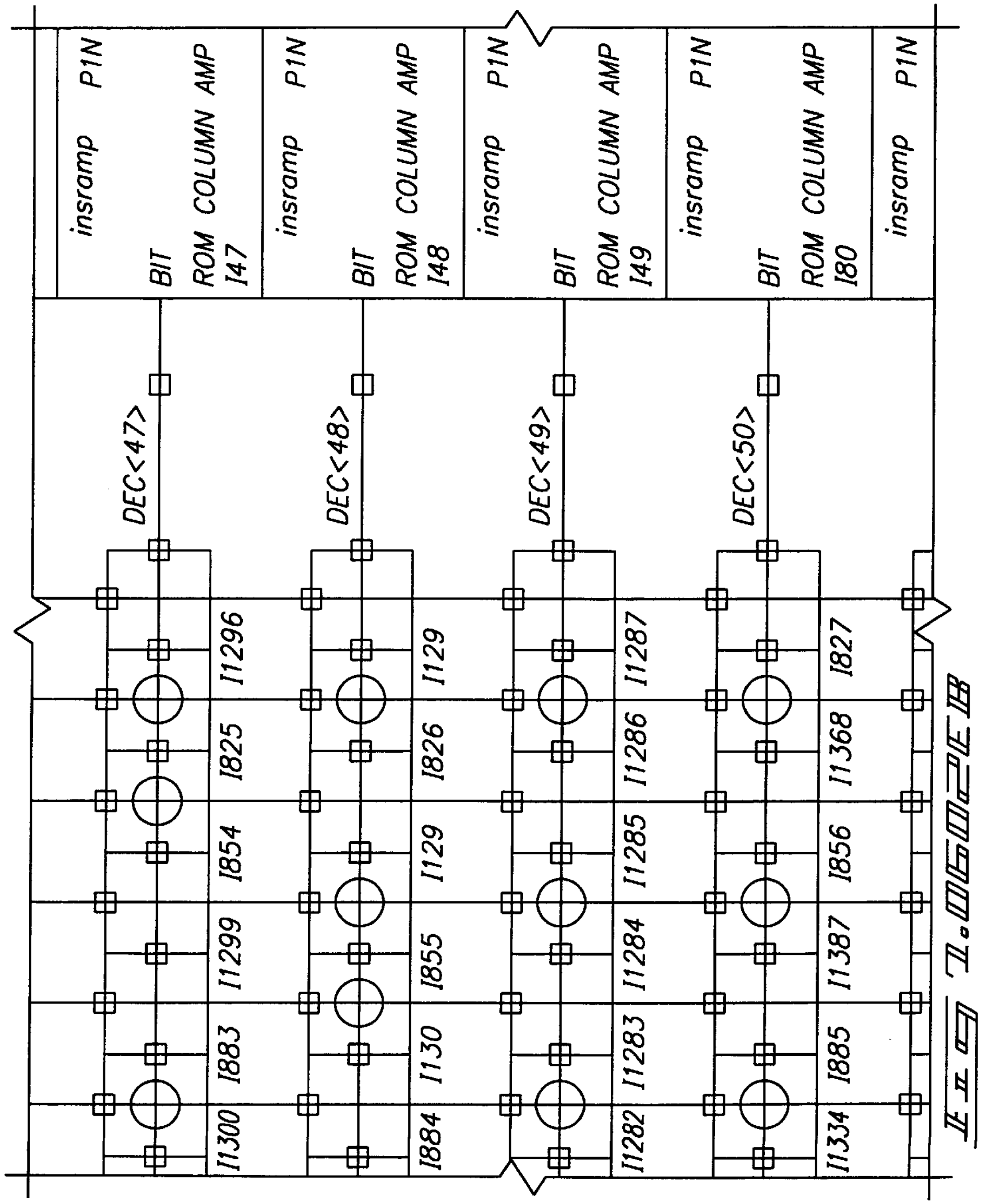
Fig. 7.0602EB

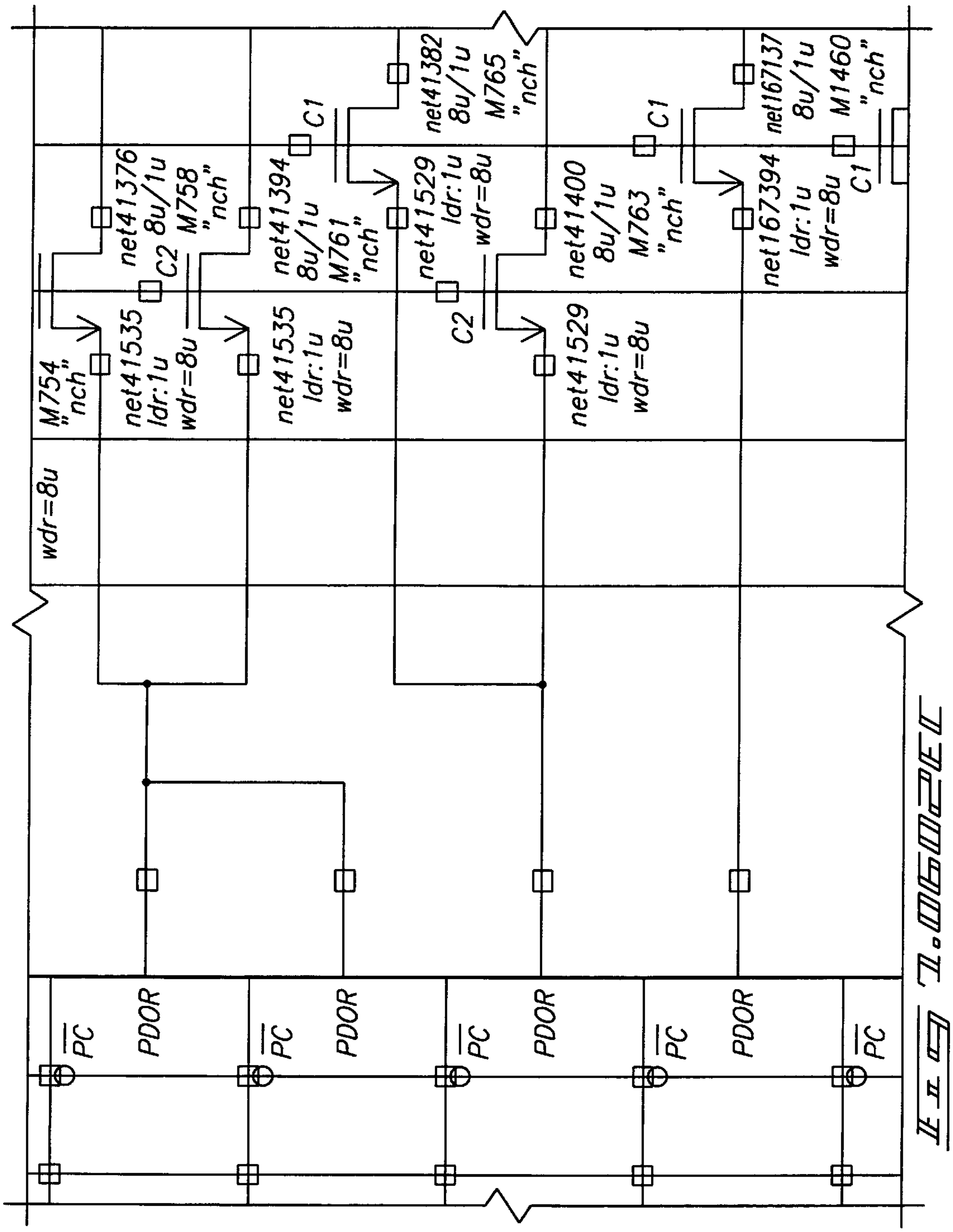
FIG 7.06G02EL

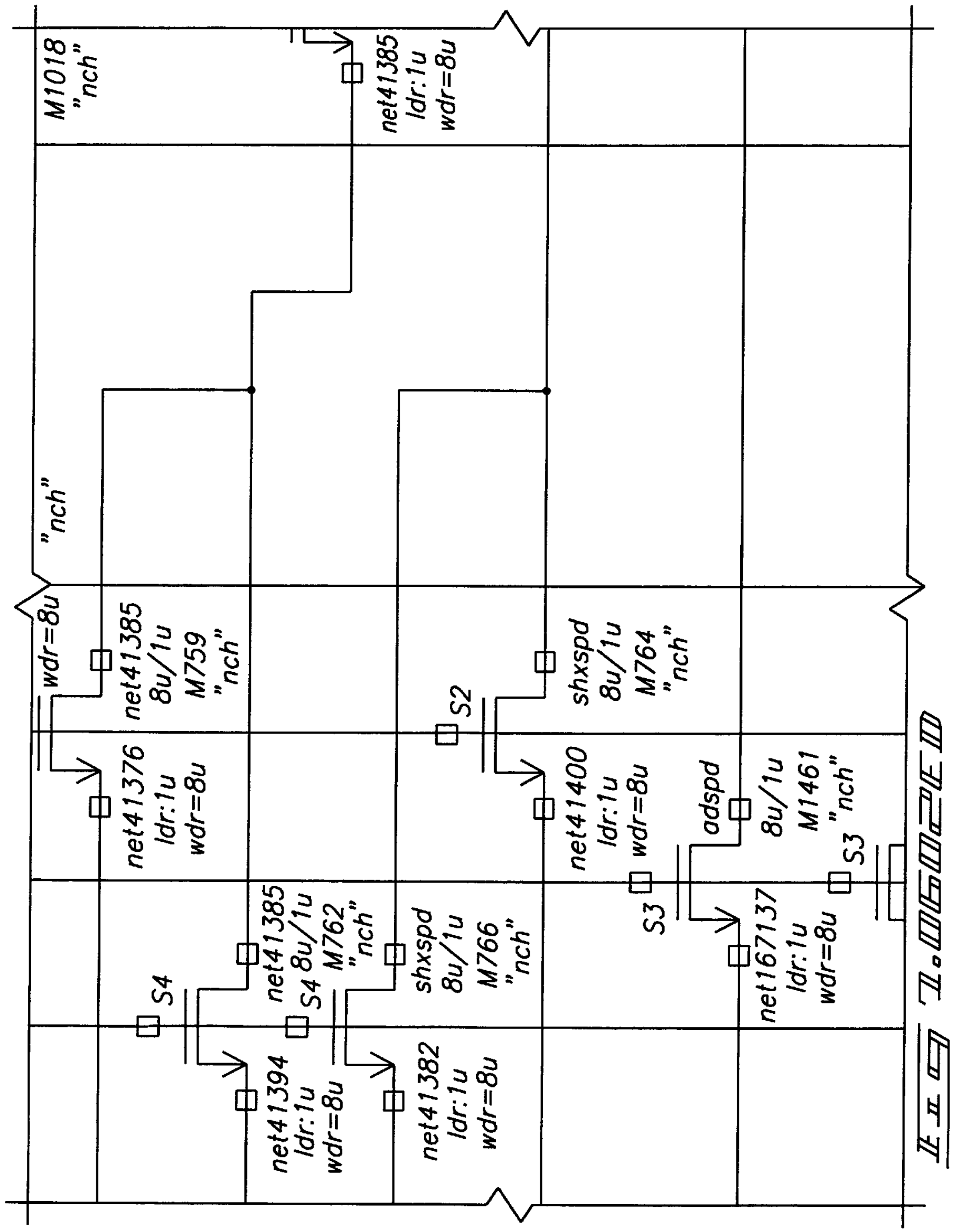
M1018
"nch"
net41385
ldr:1u
wdr=8u
"nch"
wdr=8u
net41385
8u/1u
M759
"nch"
shxspd
8u/1u
M764
"nch"
S2
net41376
ldr:1u
wdr=8u
net41400
ldr:1u
wdr=8u
adspd
8u/1u
M1461
"nch"
S3
S3
net167137
ldr:1u
wdr=8u
net41385
8u/1u
M762
"nch"
S4
S4
shxspd
8u/1u
M766
"nch"
net41394
ldr:1u
wdr=8u
net41382
ldr:1u
wdr=8u

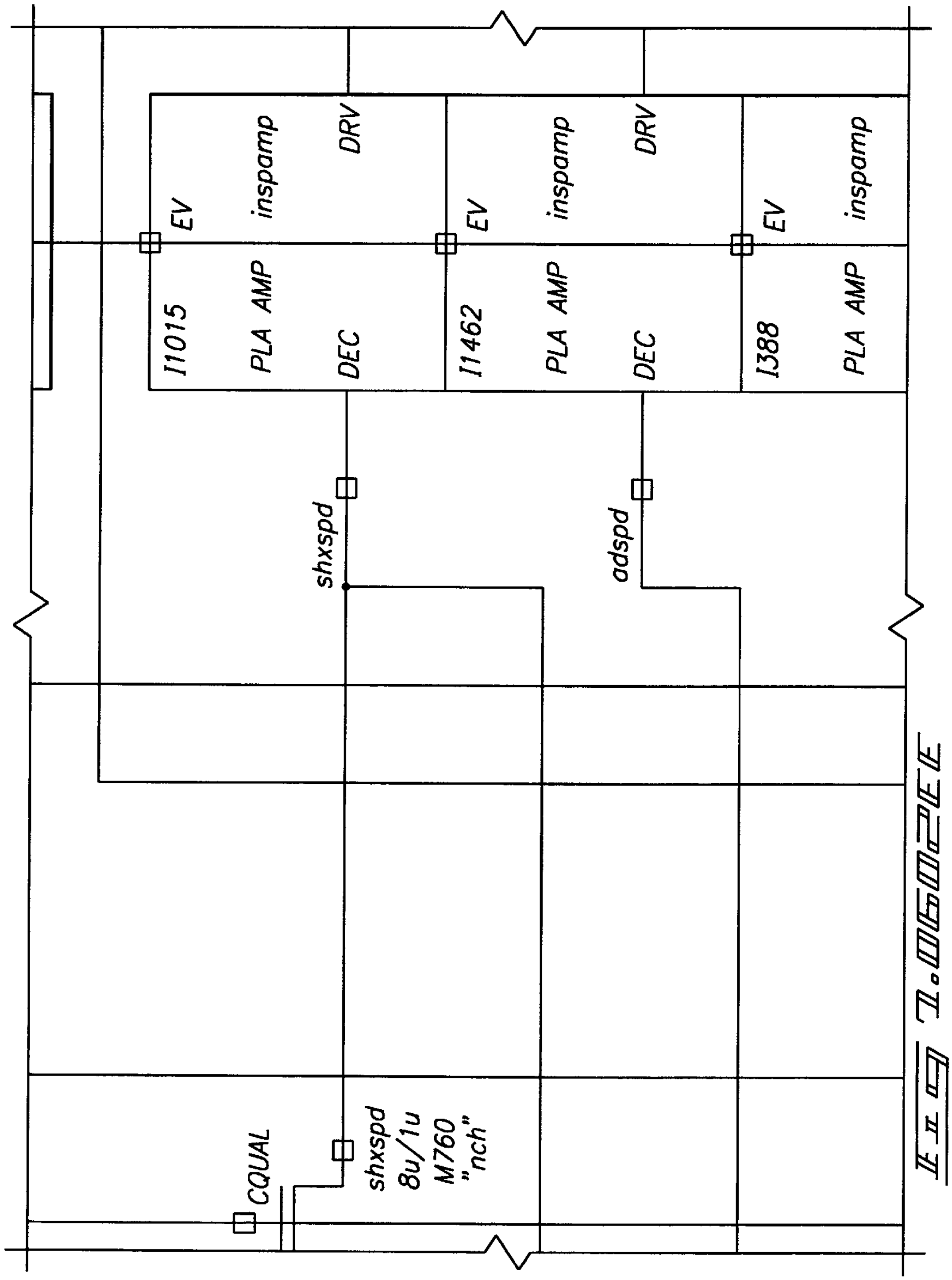
Fig. 7.06.02EE

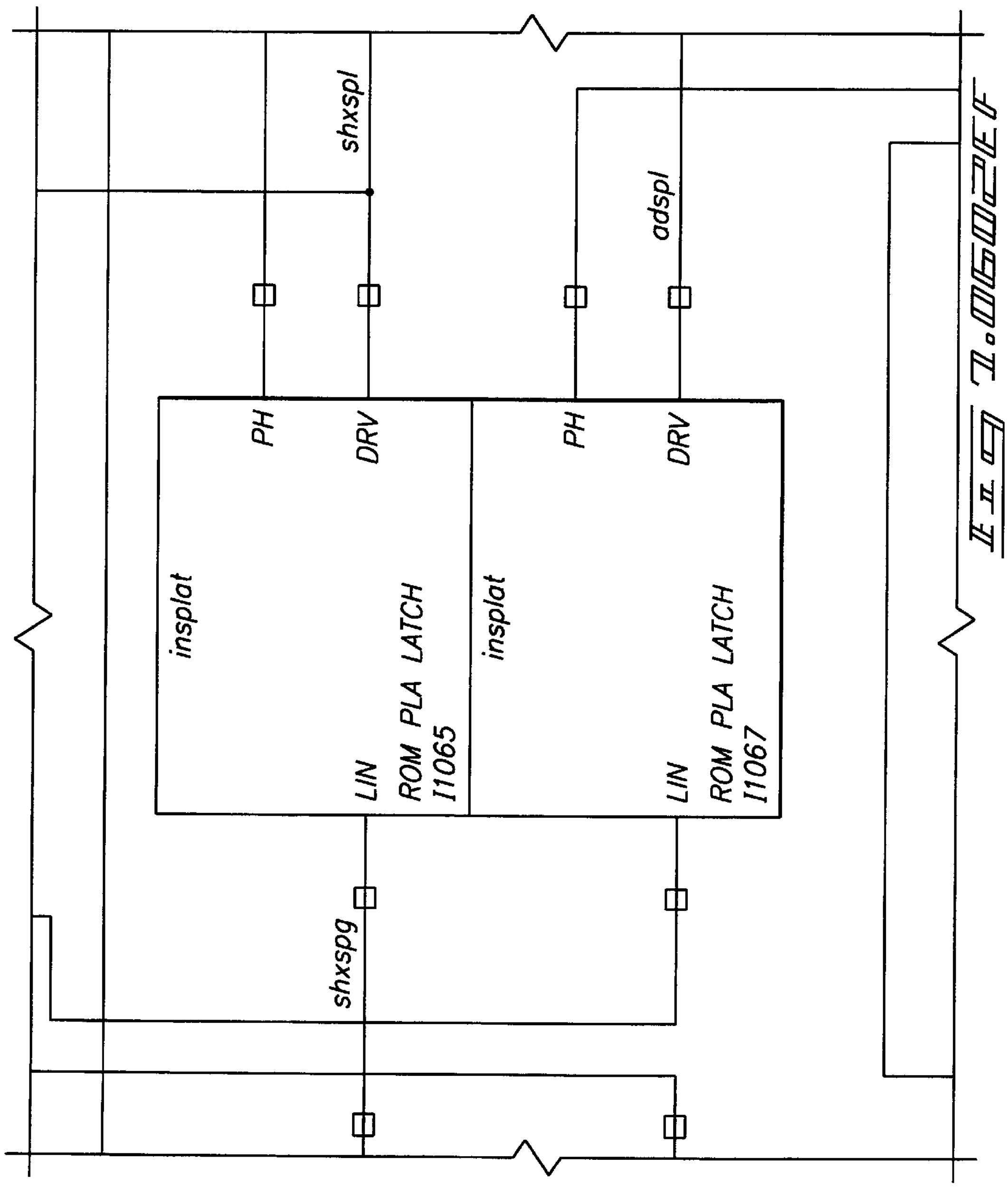
Fig. 7.060ZEF

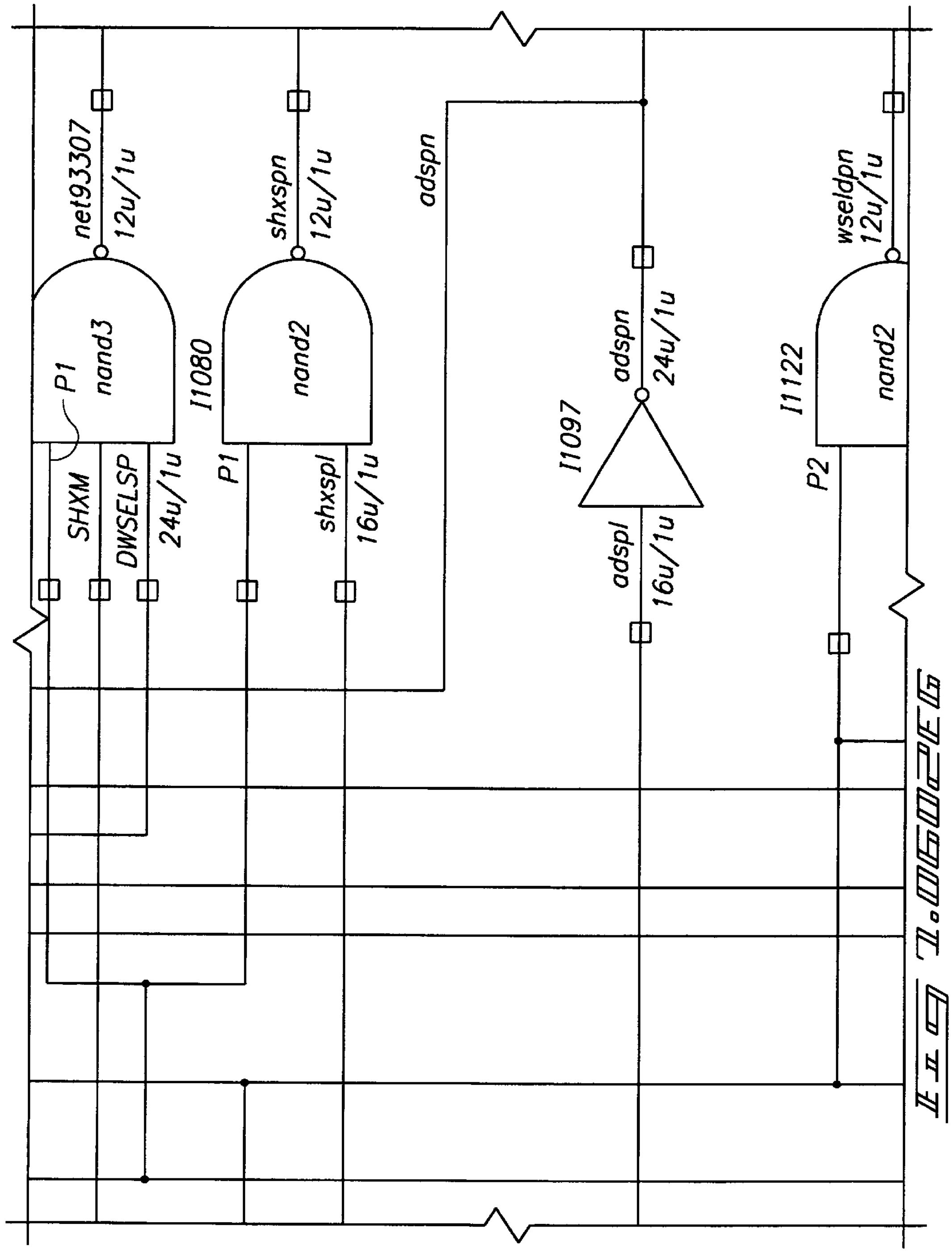
FIG. 7.0602EG

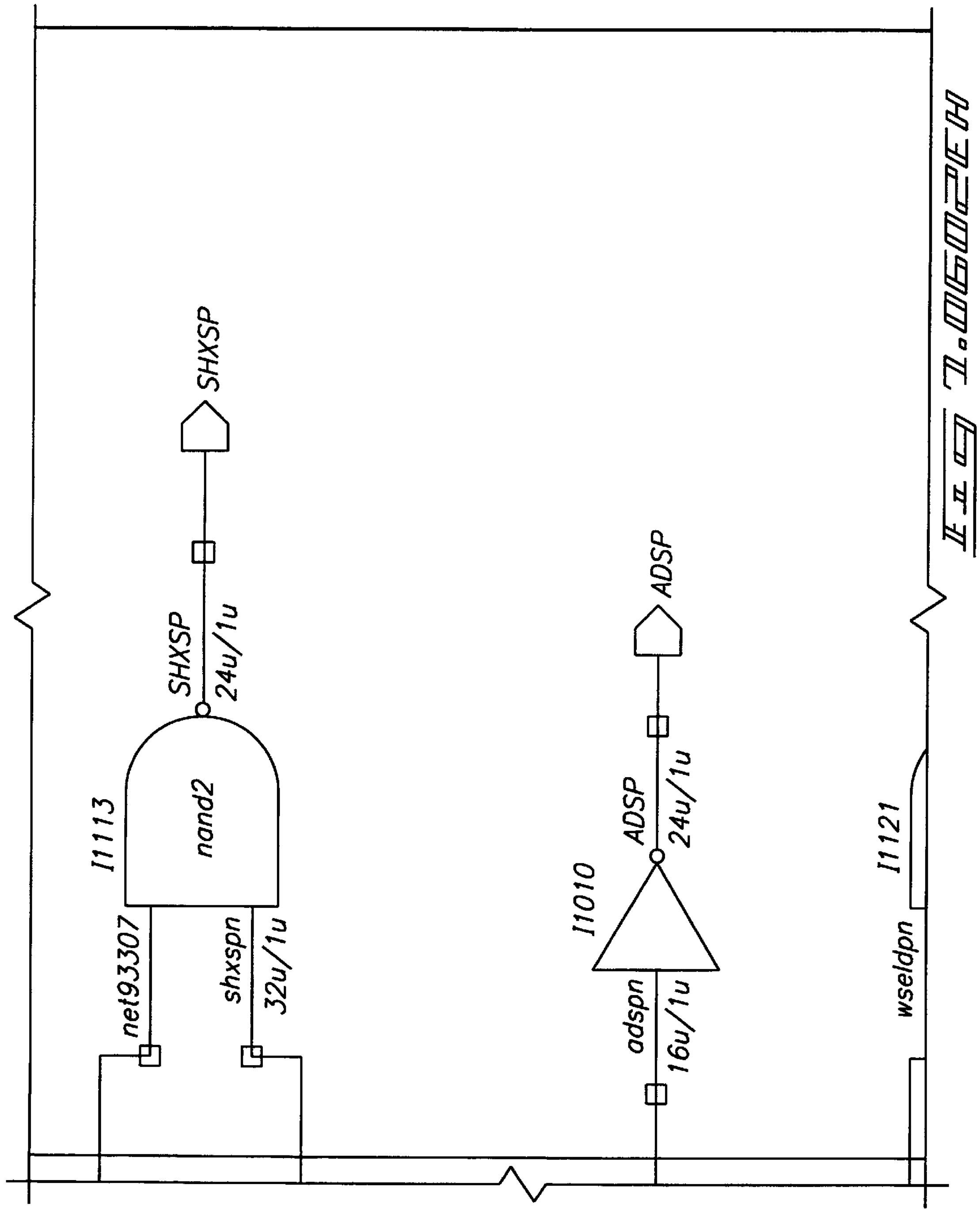
FIG. 7.0602EH

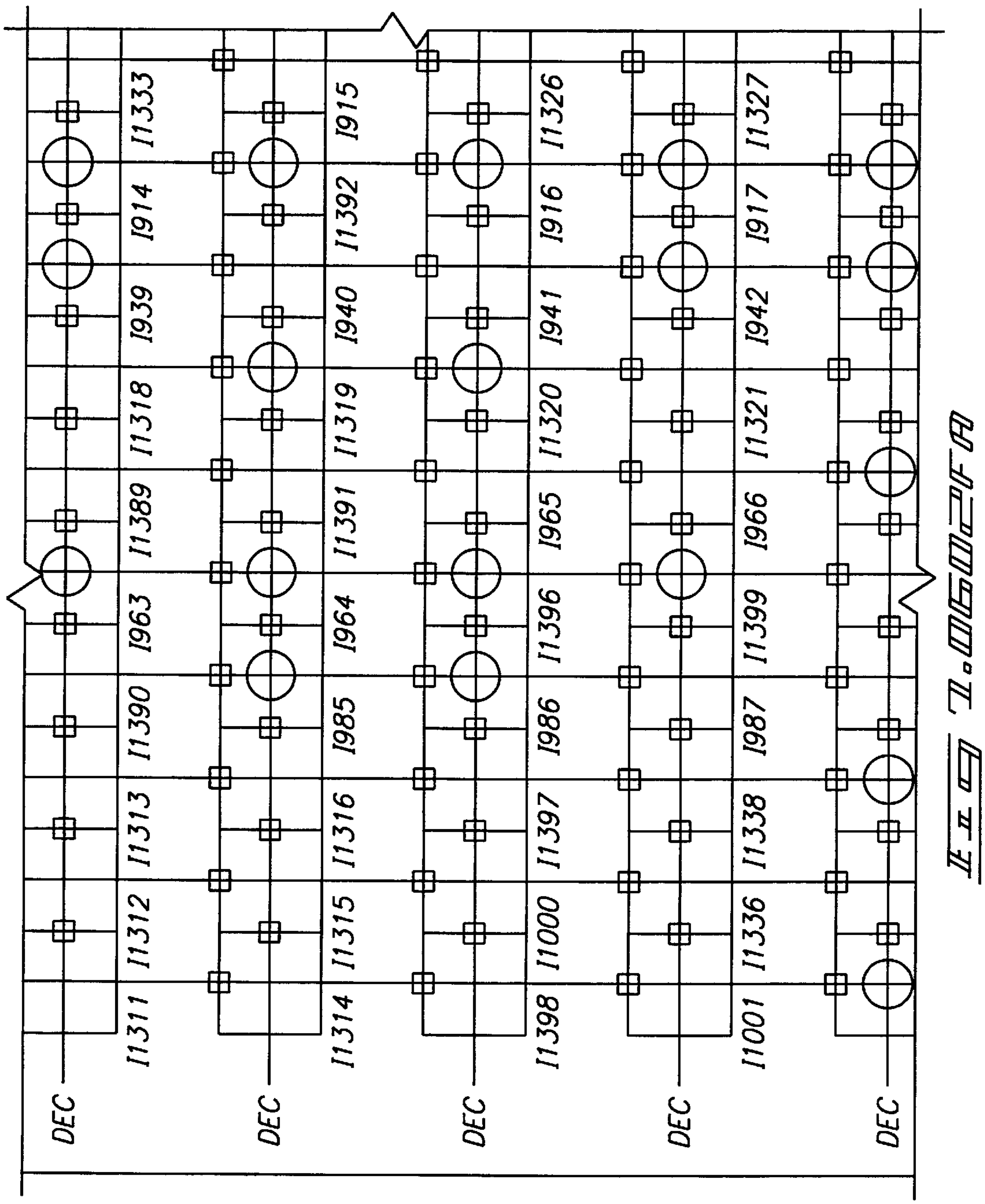
Fig 1.0602FA

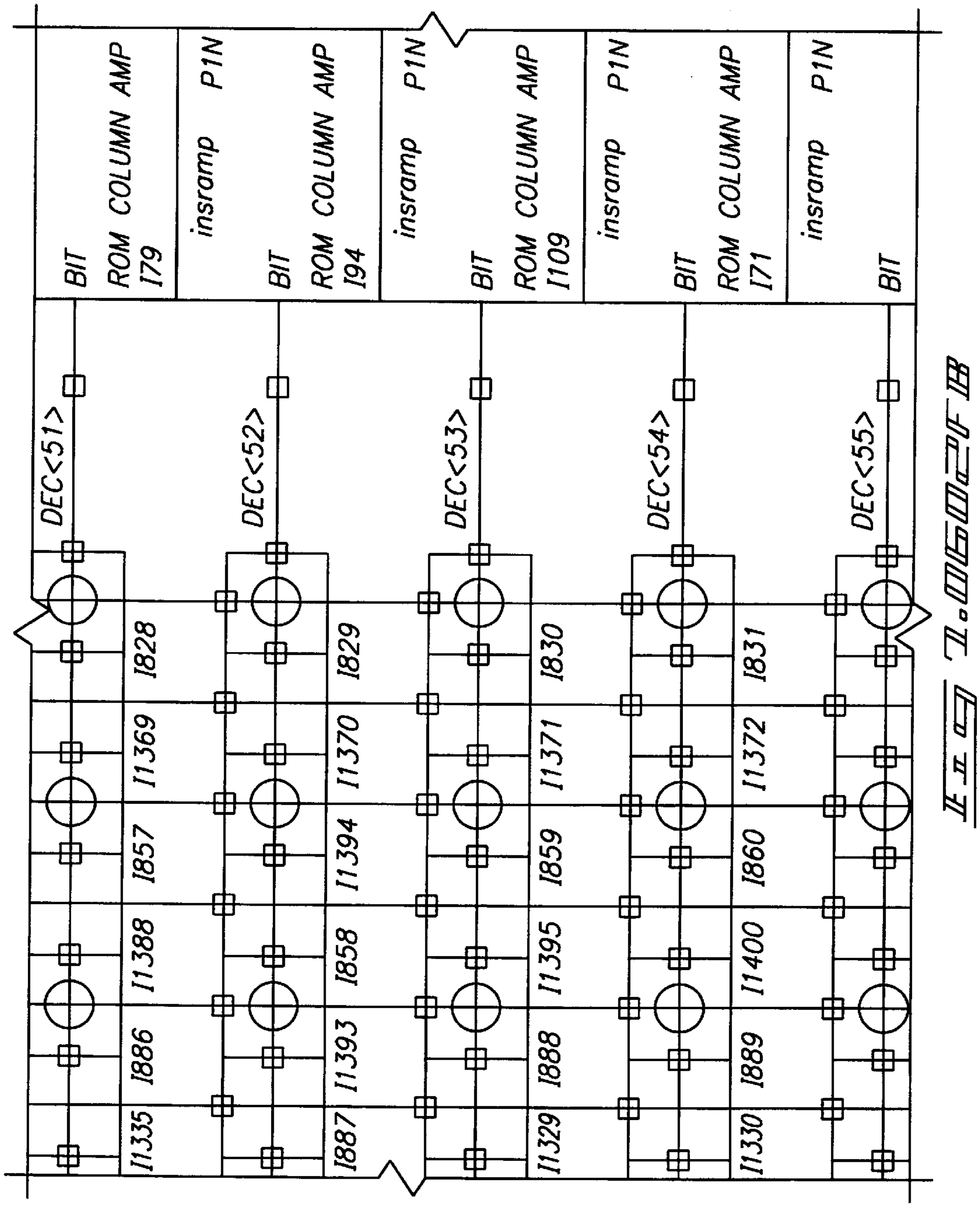
Fig. 1.0602FB

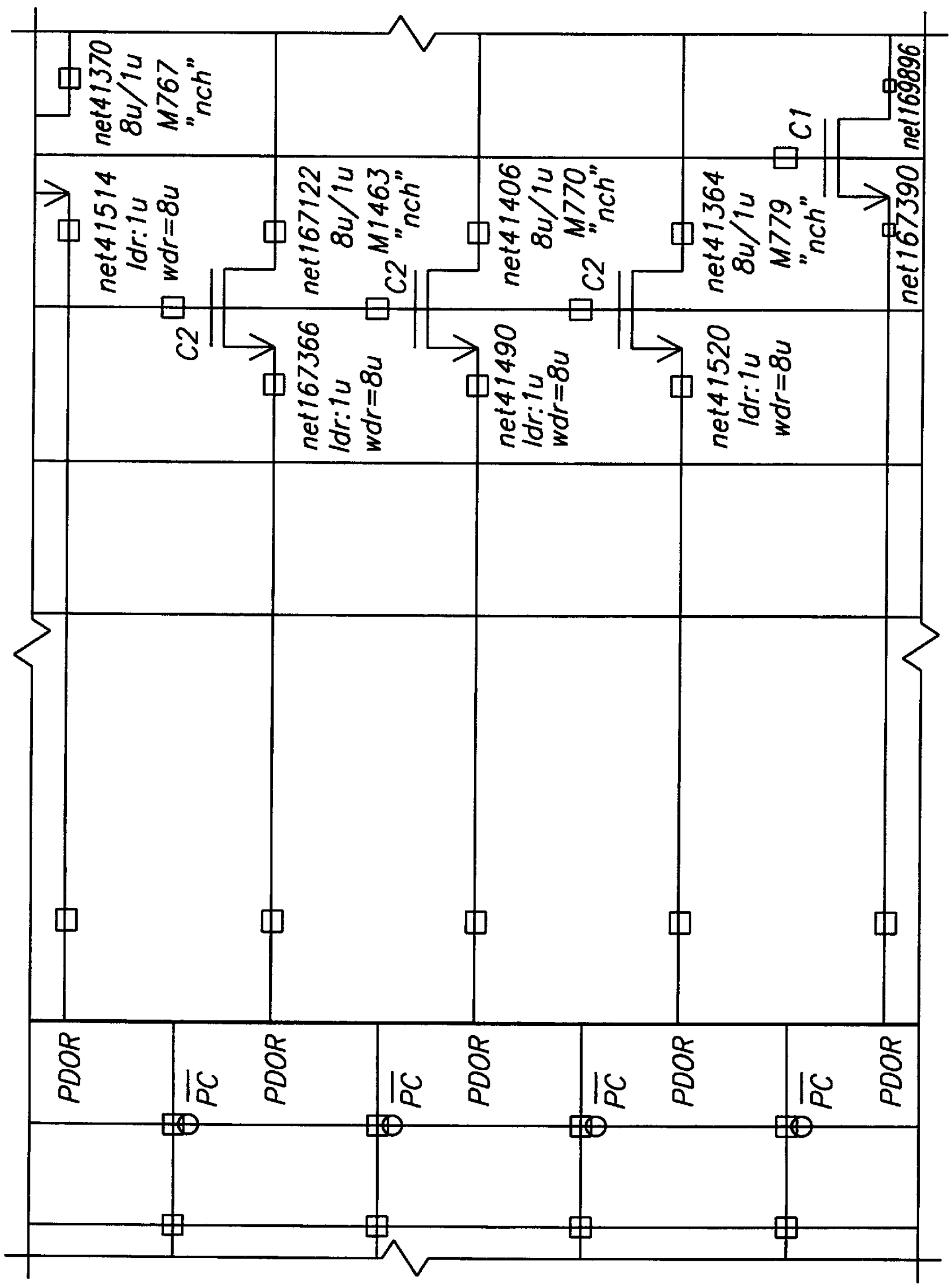
Fig 7.0602FC

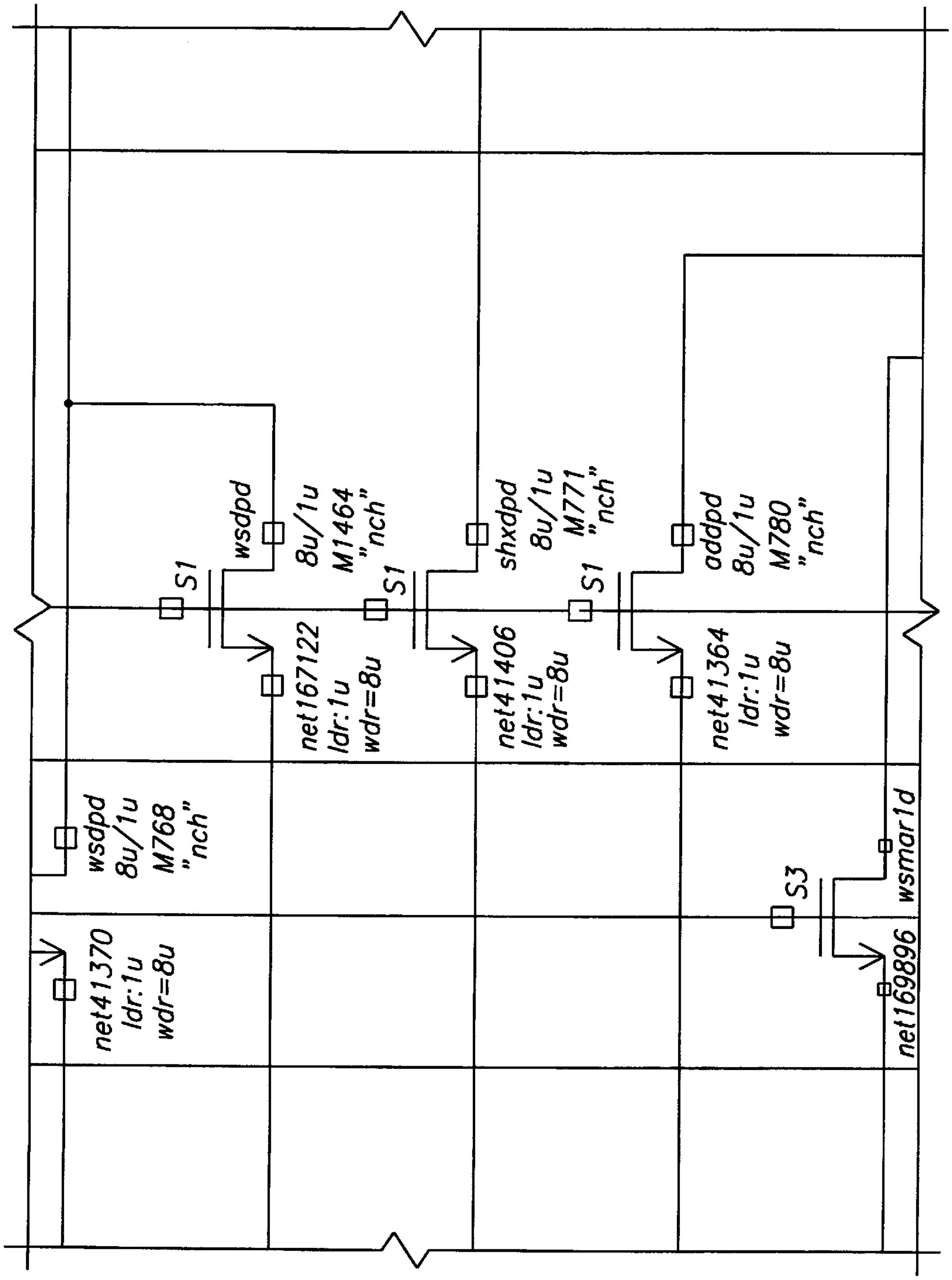
Fig. 1.0602FD

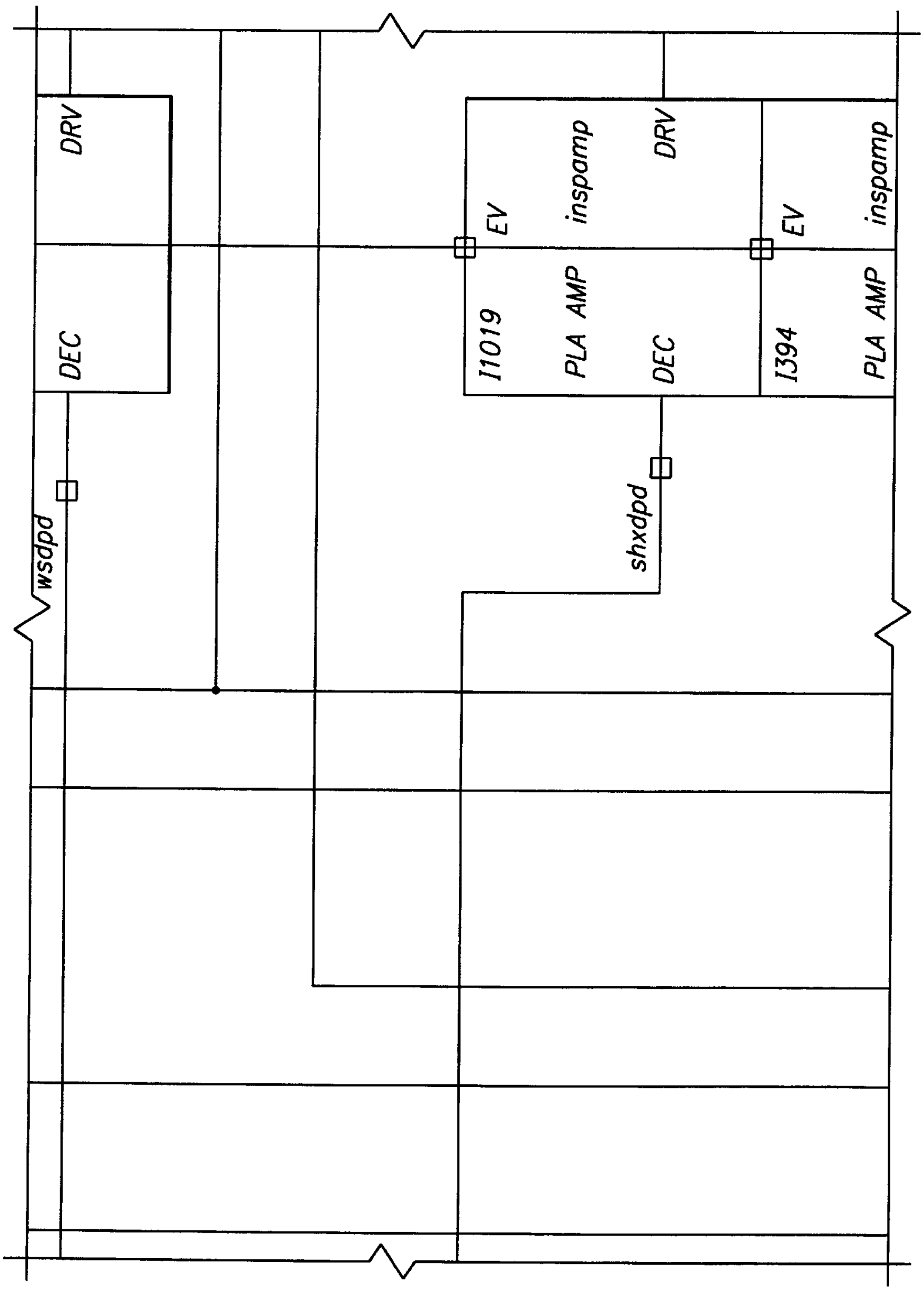
FIG. 1.0602FE

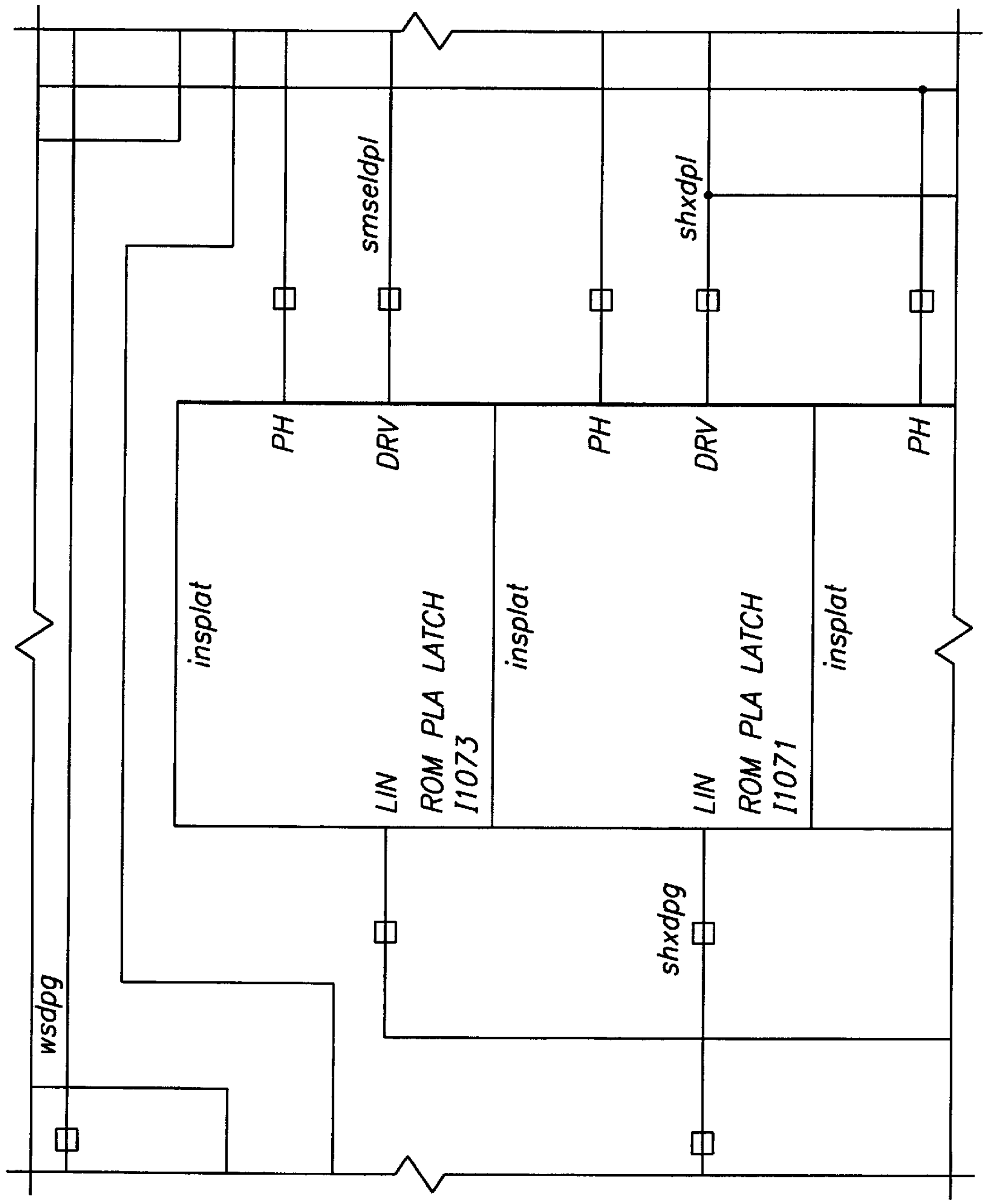
Fig. 7.0602FF

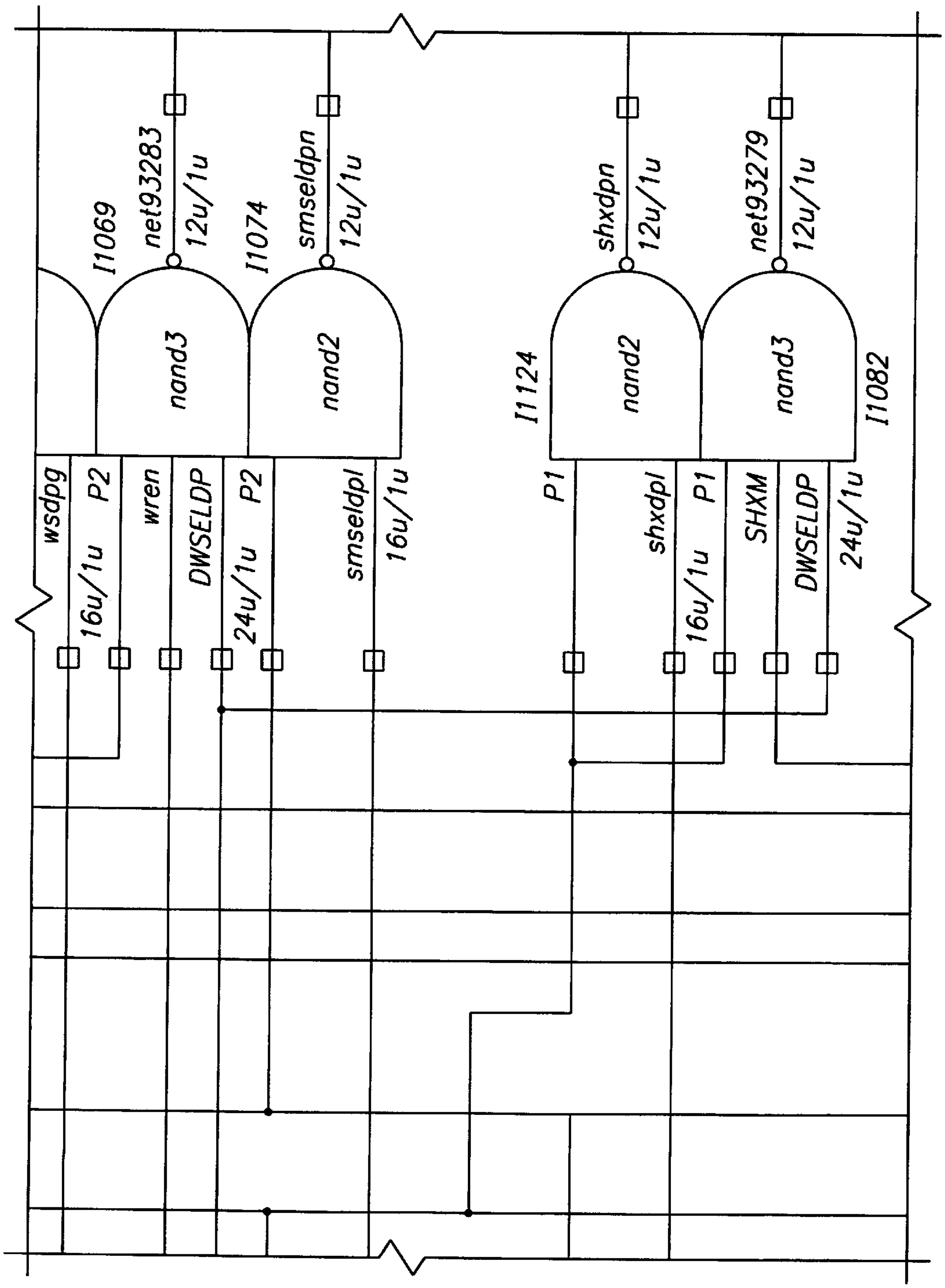
FIG. 1.060.2FG

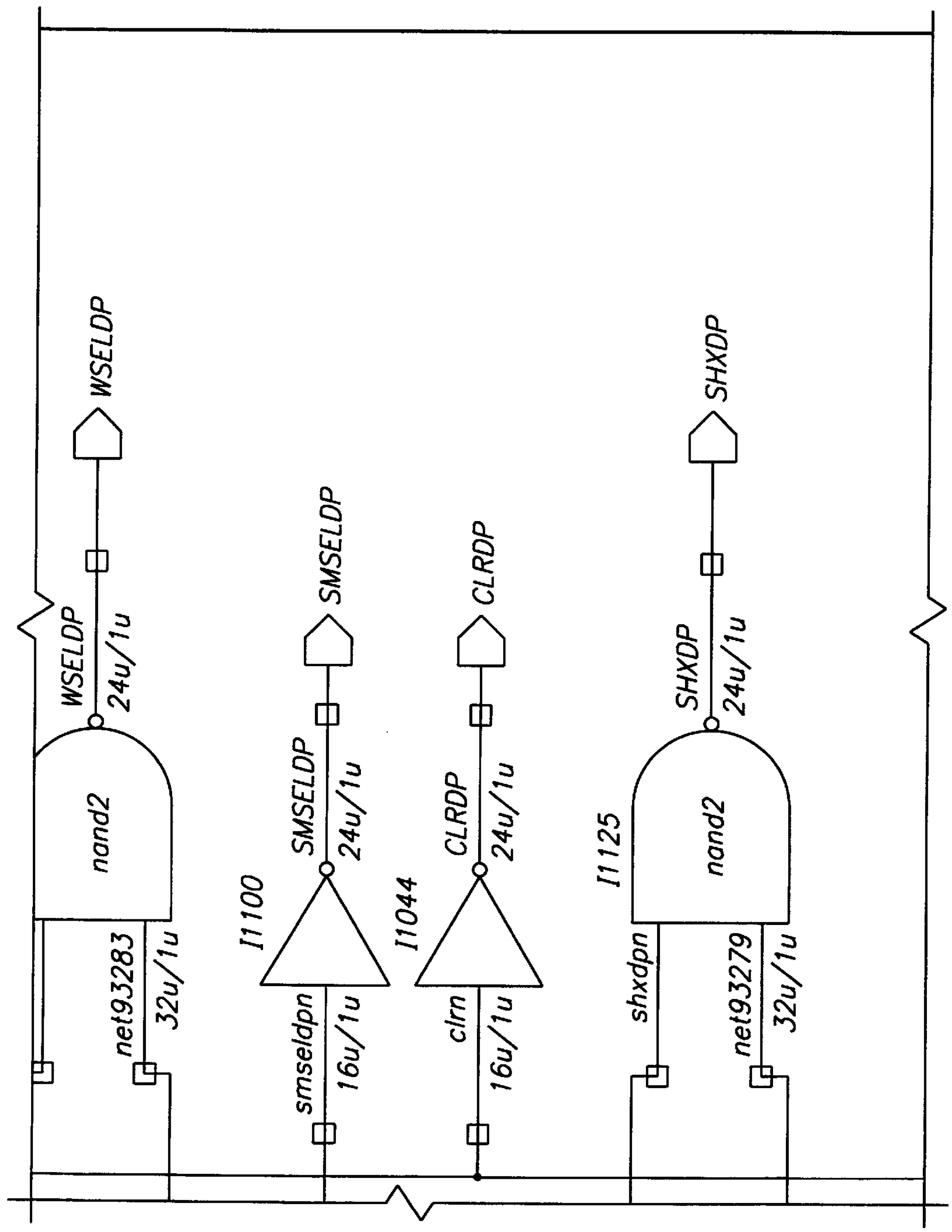
FIG. 7.0602FH

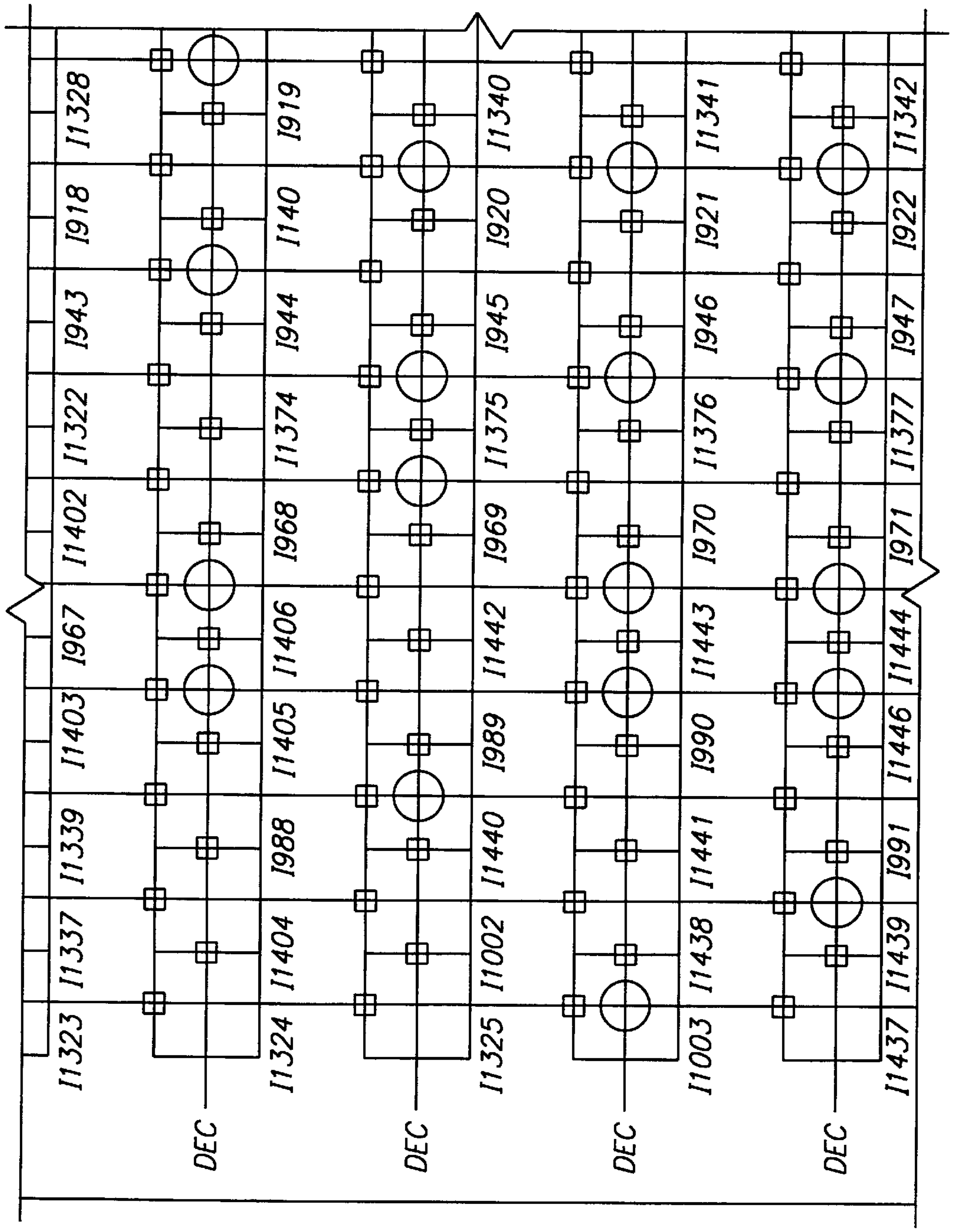
FIG. 1.06026A

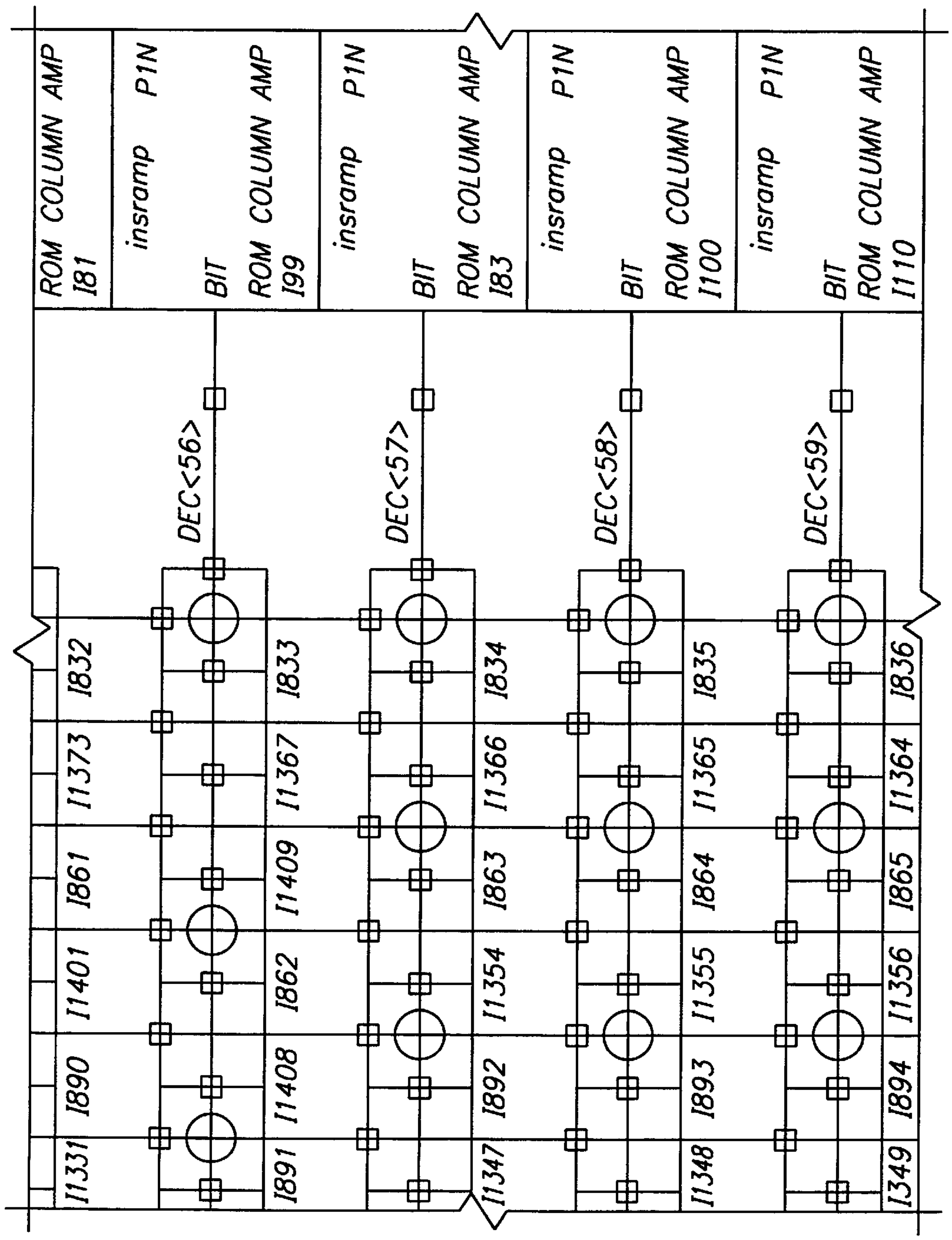
Fig. 7.06026B

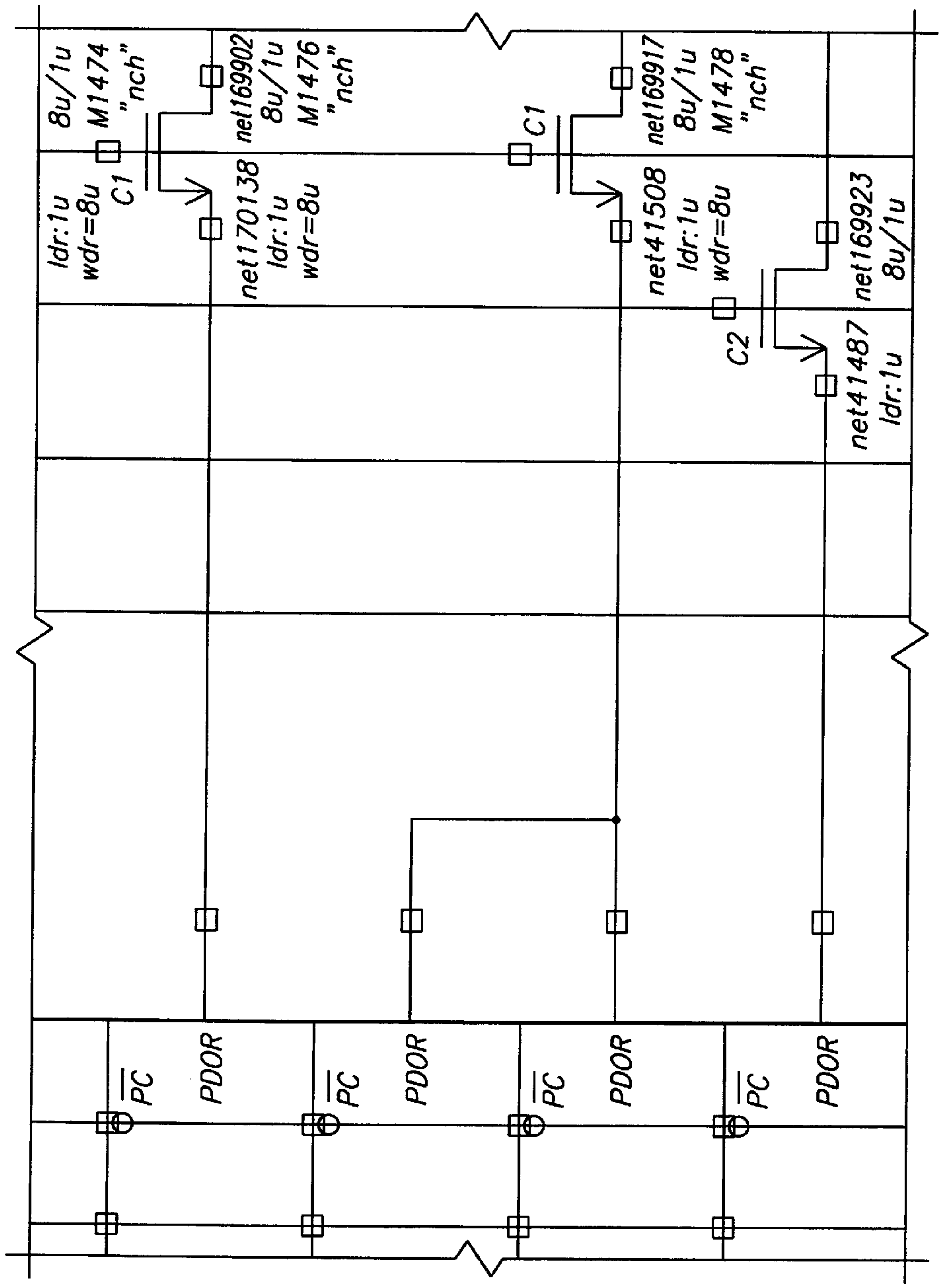
Fig. 7.0602GC

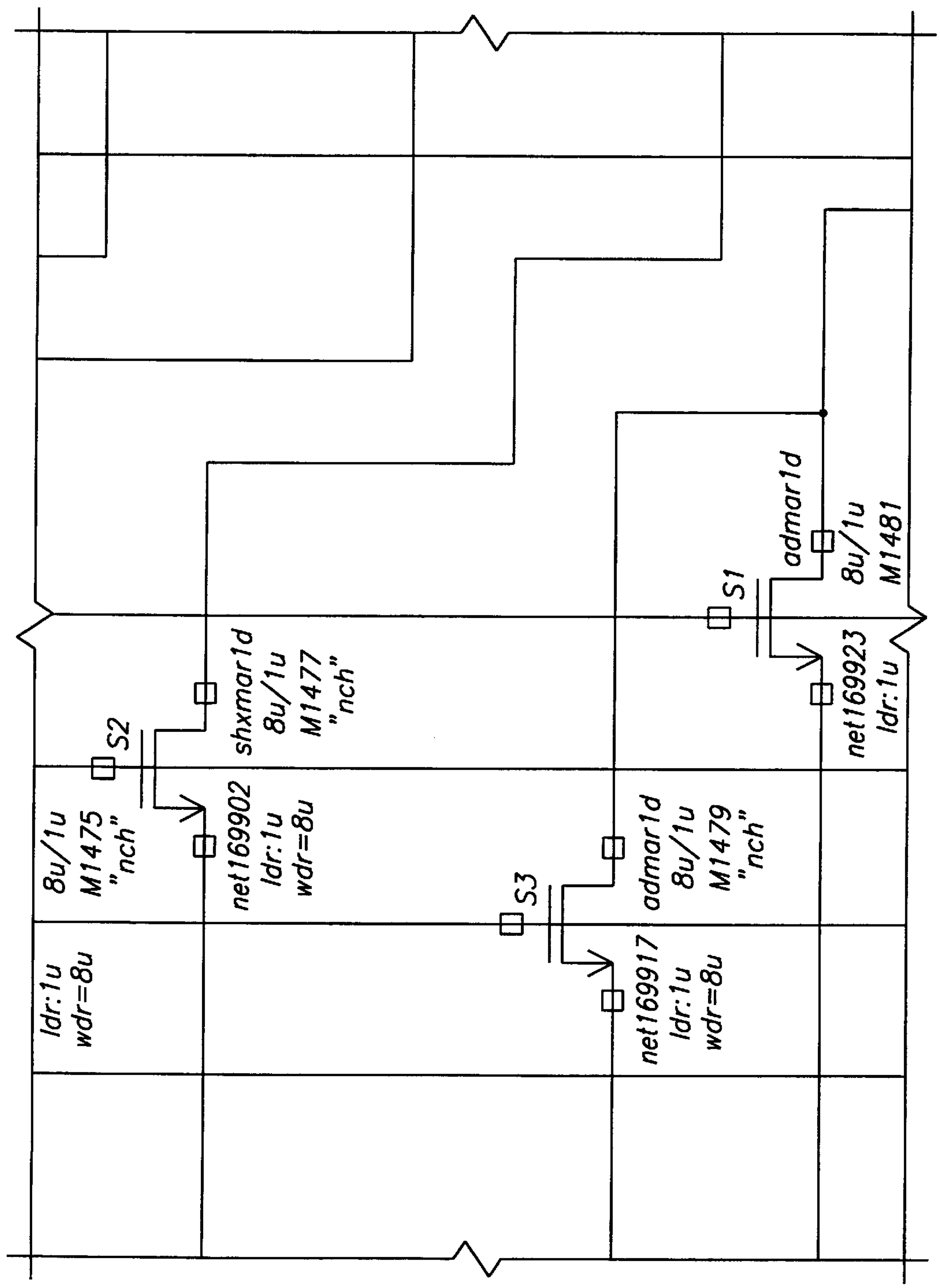
FIG. 1.006026D

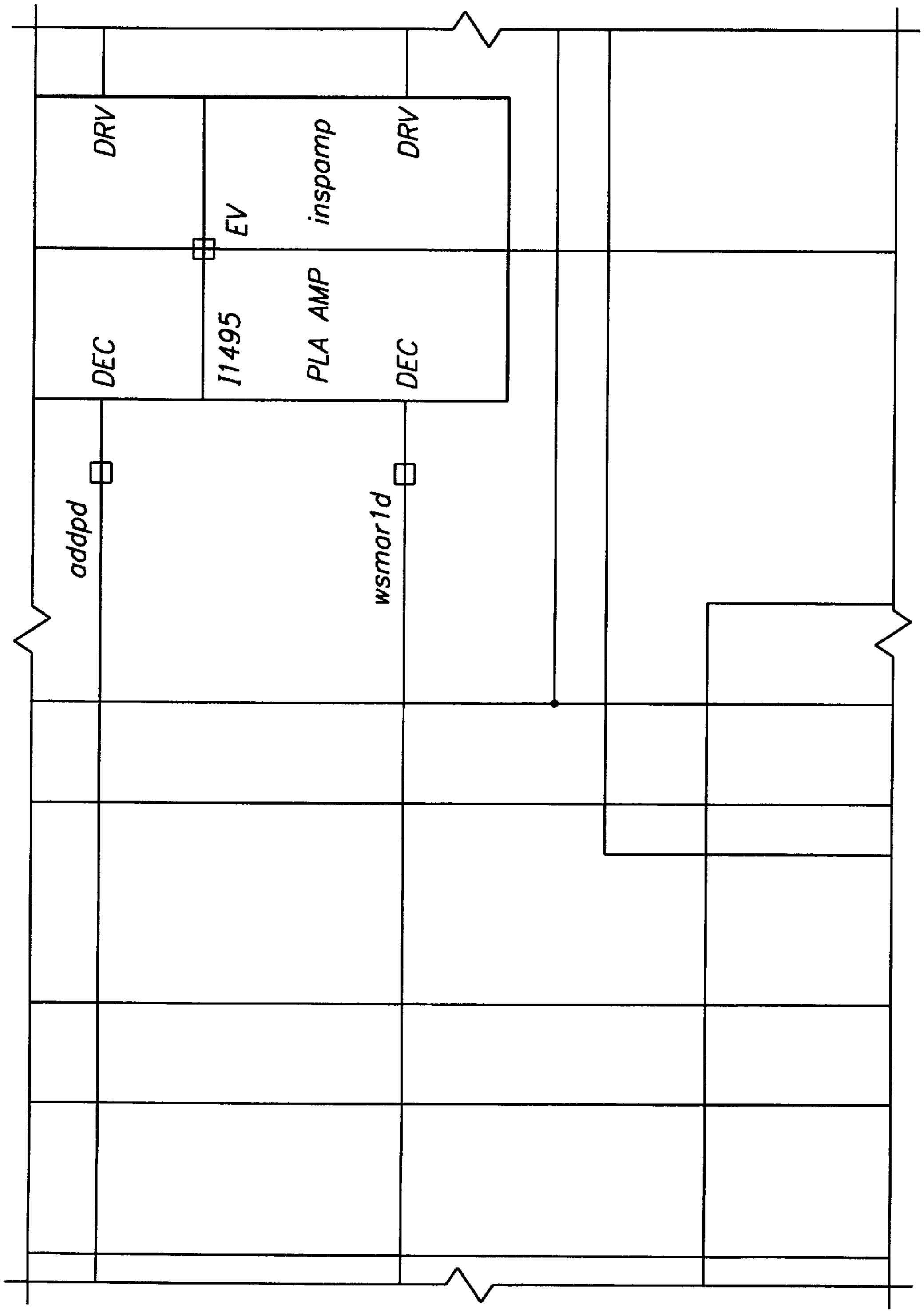
FIG. 1.0602GE

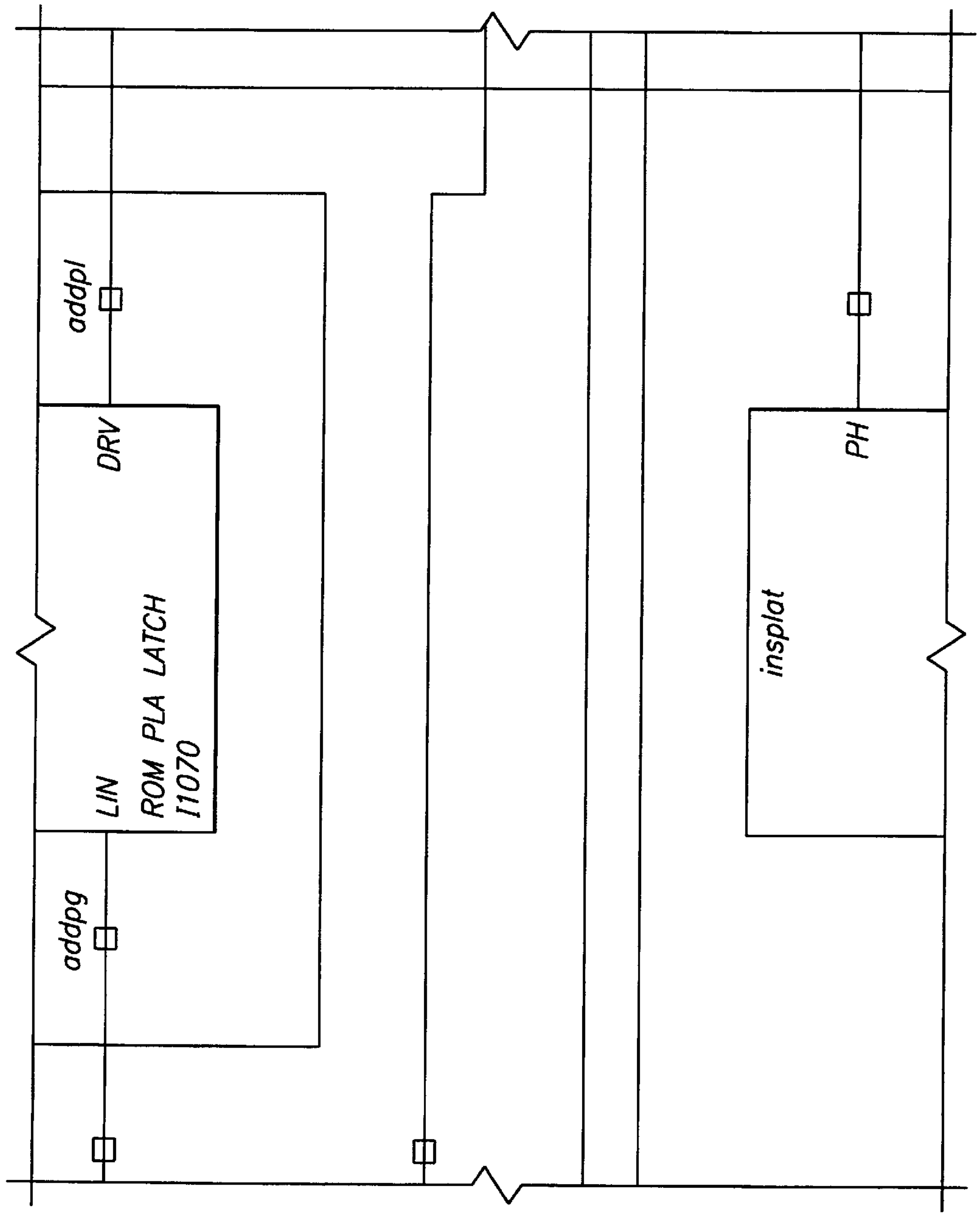
Fig. 7.0602GF

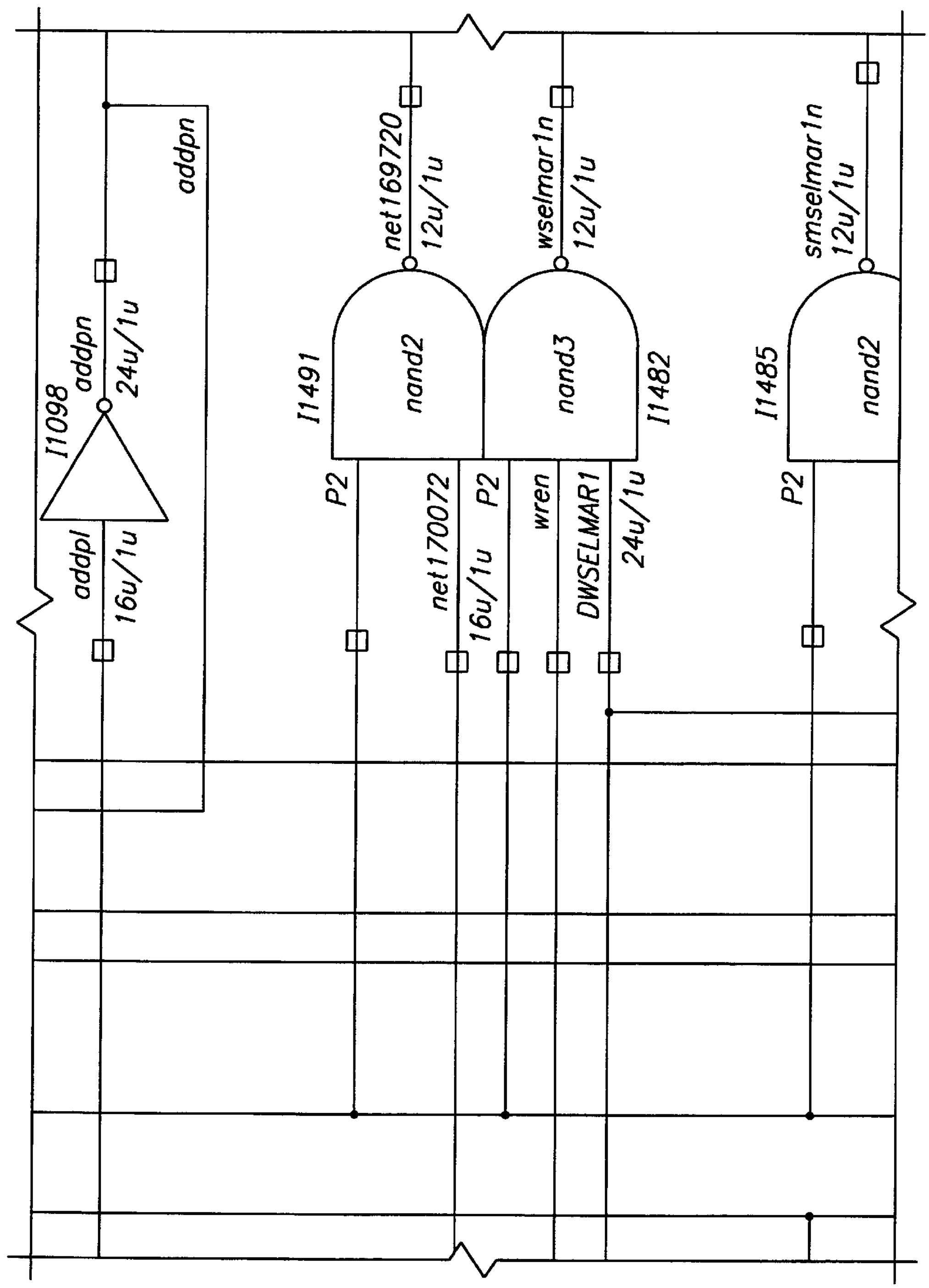
Fig 7.0602GG

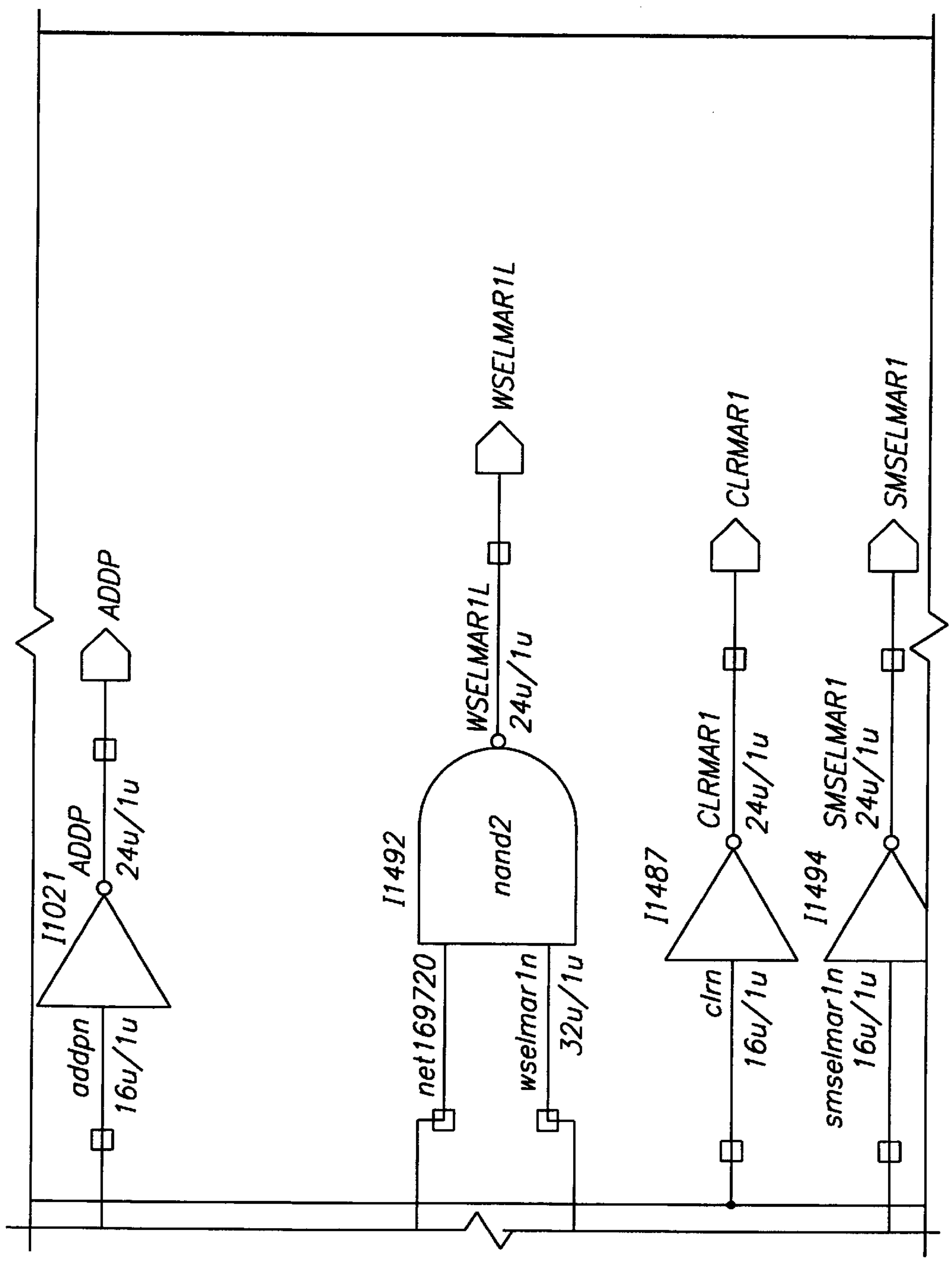
Fig. 1.060GH

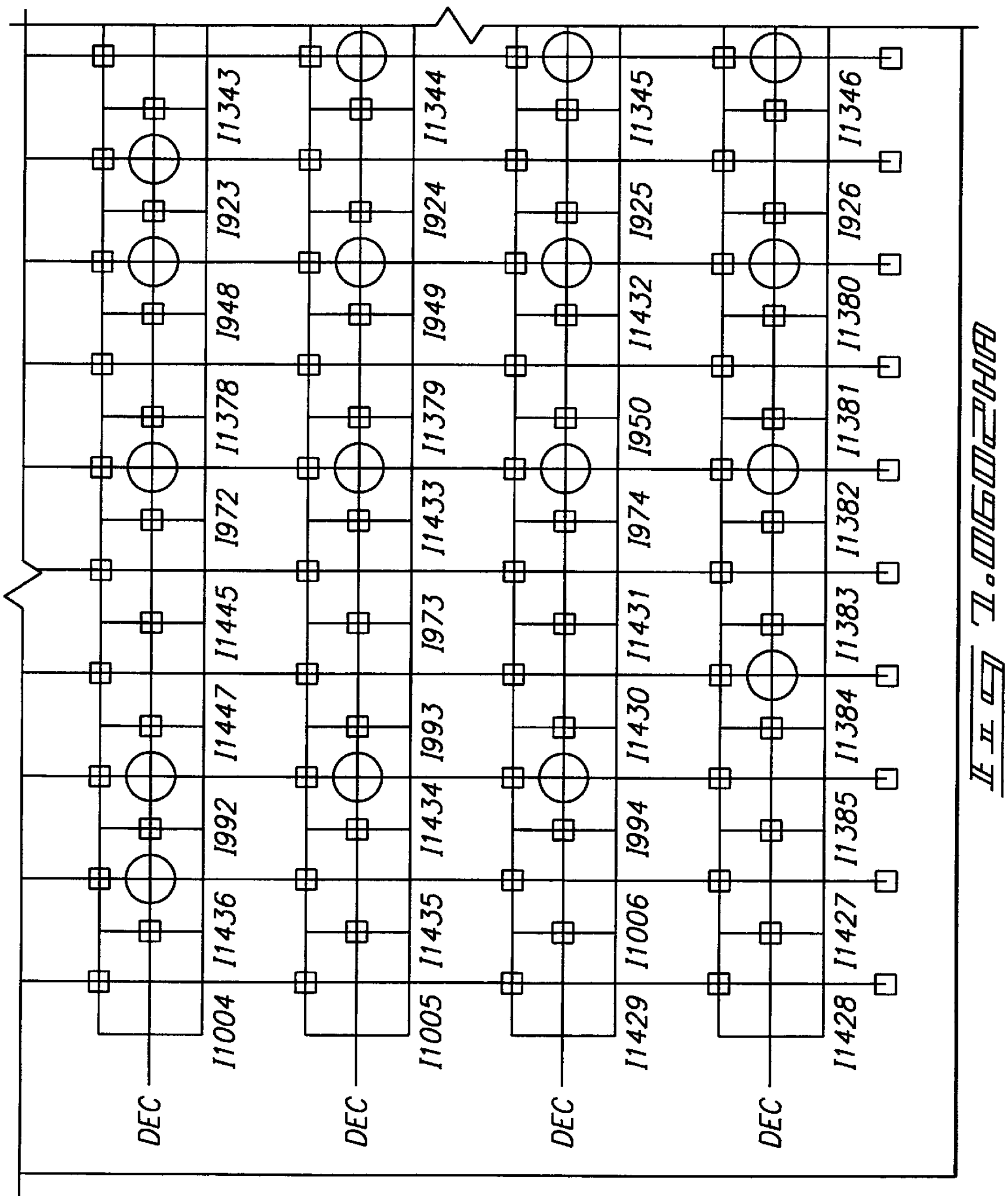
FIG. 7.060ZHA

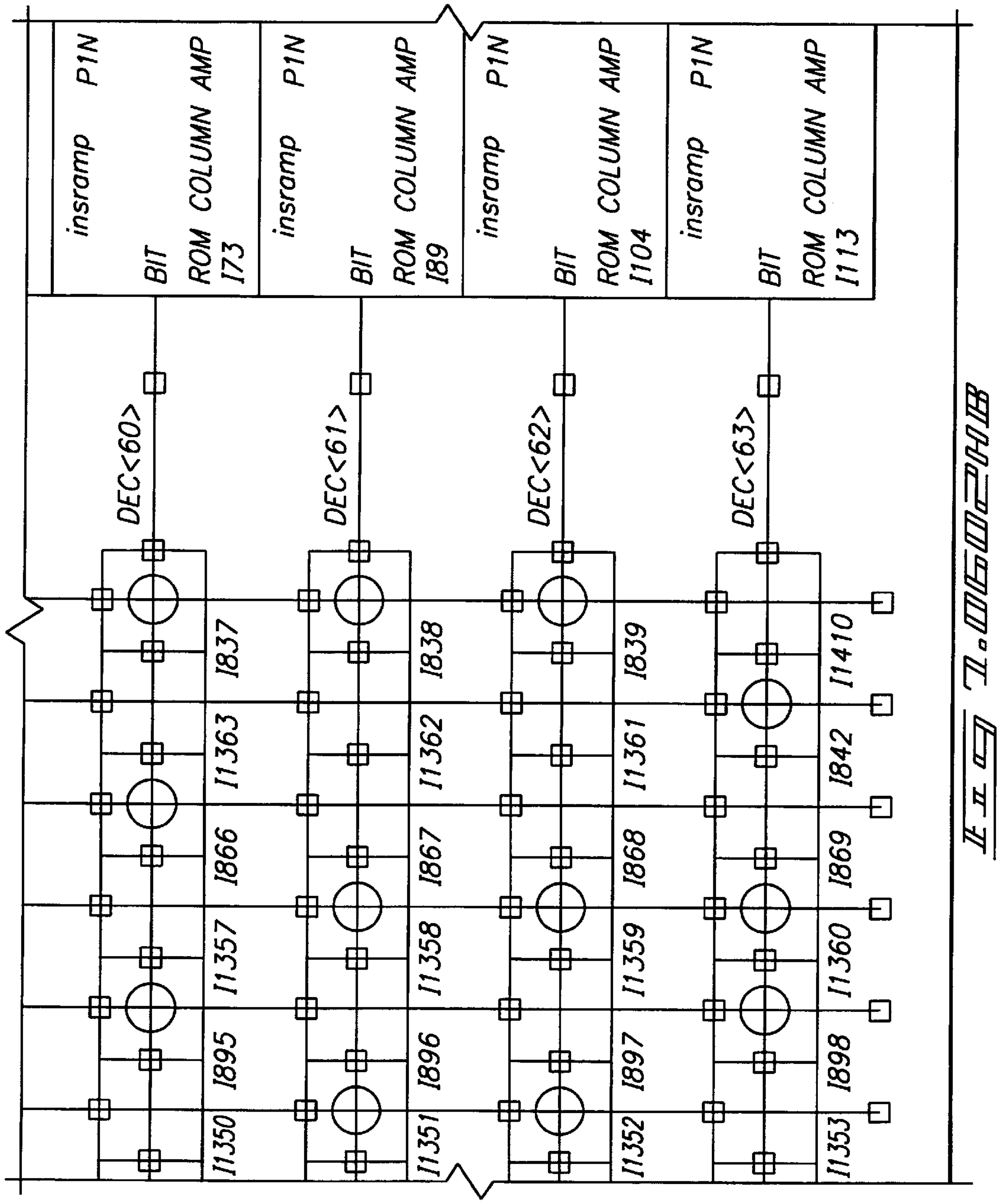
FIG. 7.0602HB

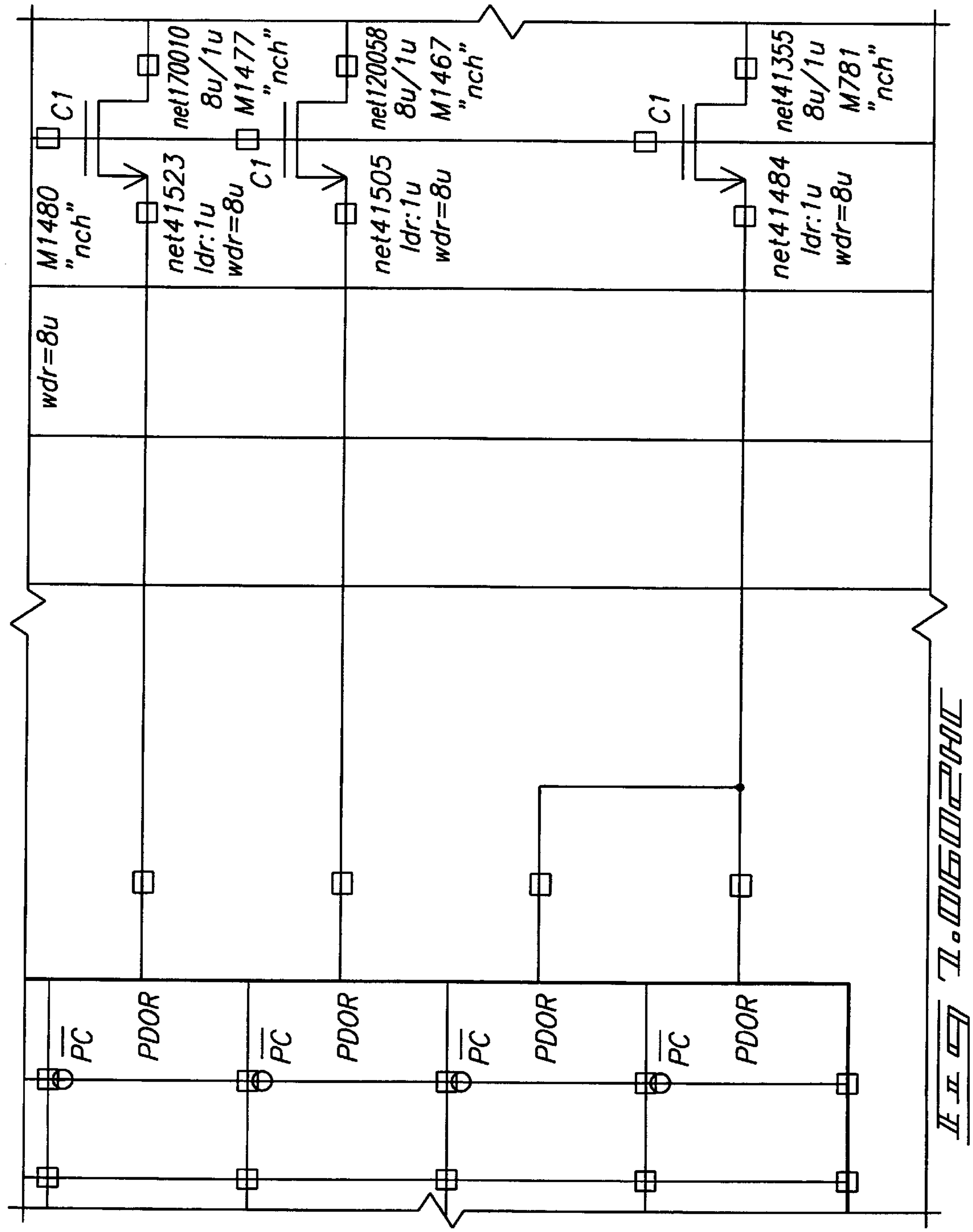
C1
net170010
8u/1u
M1477
"nch"
net120058
8u/1u
M1467
"nch"
net41355
8u/1u
M781
"nch"
M1480
"nch"
net41523
ldr:1u
wdr=8u
net41505
ldr:1u
wdr=8u
net41484
ldr:1u
wdr=8u
wdr=8u
PC
PDOR

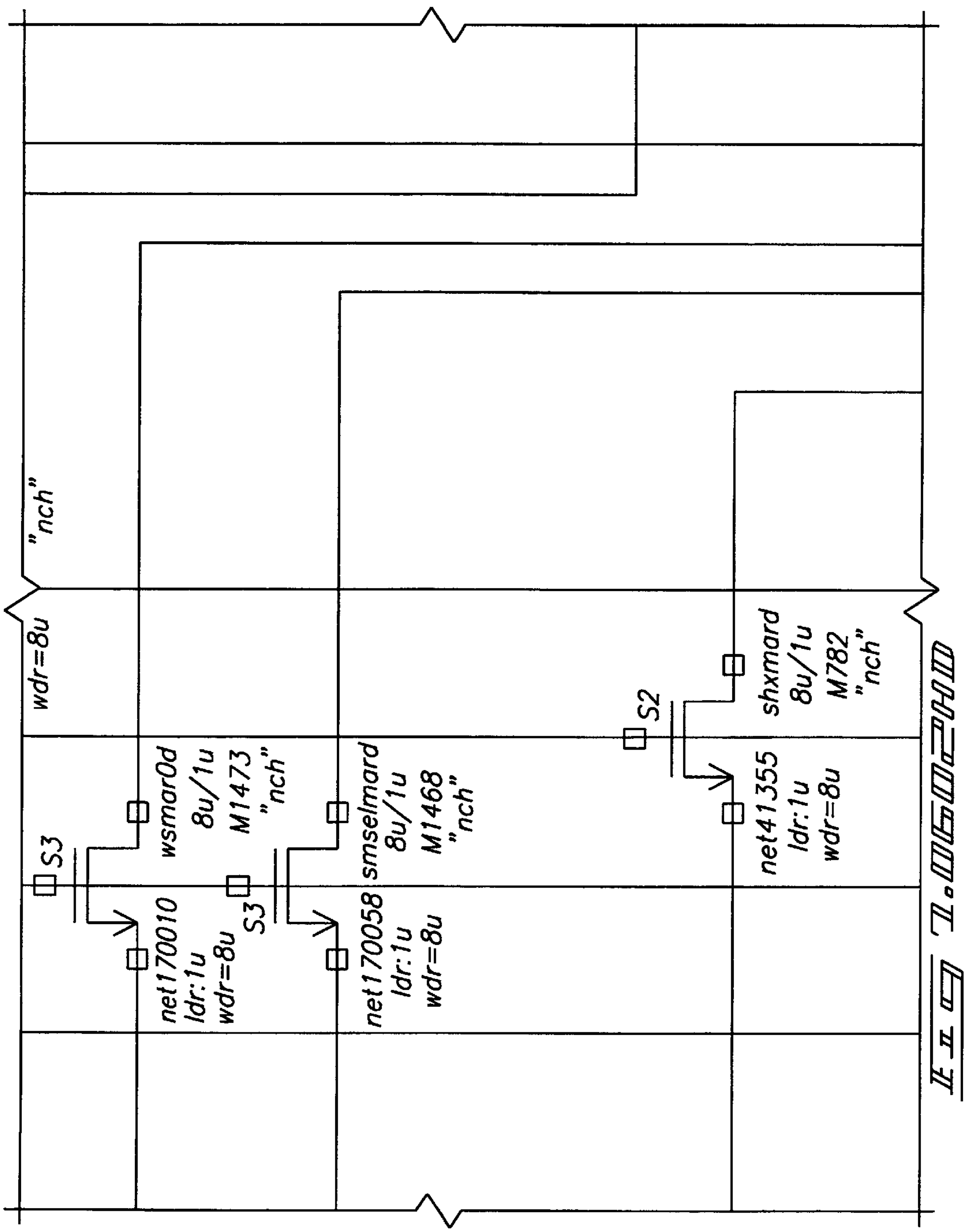
FIG. 7.06602AD

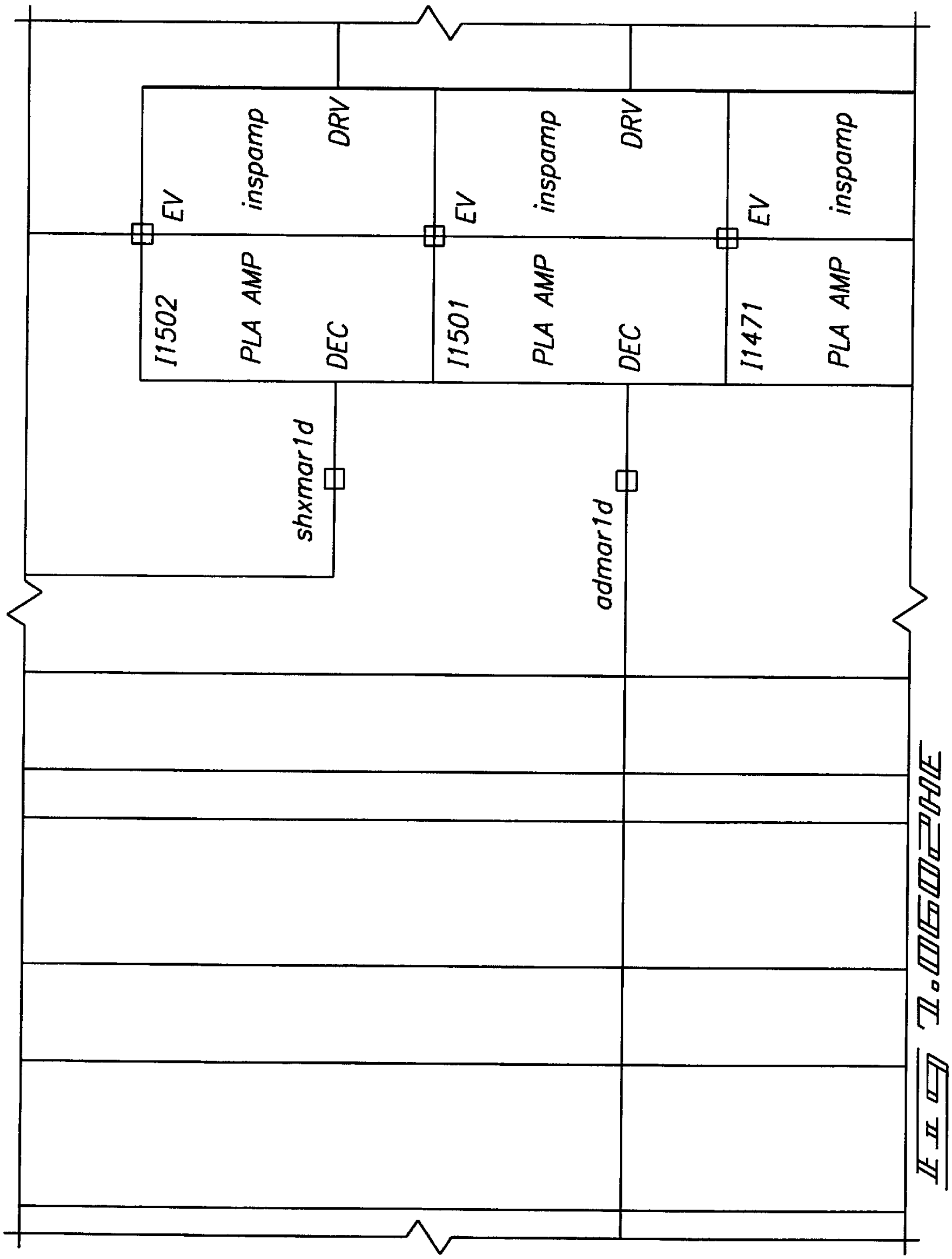
Fig 7.0602HE

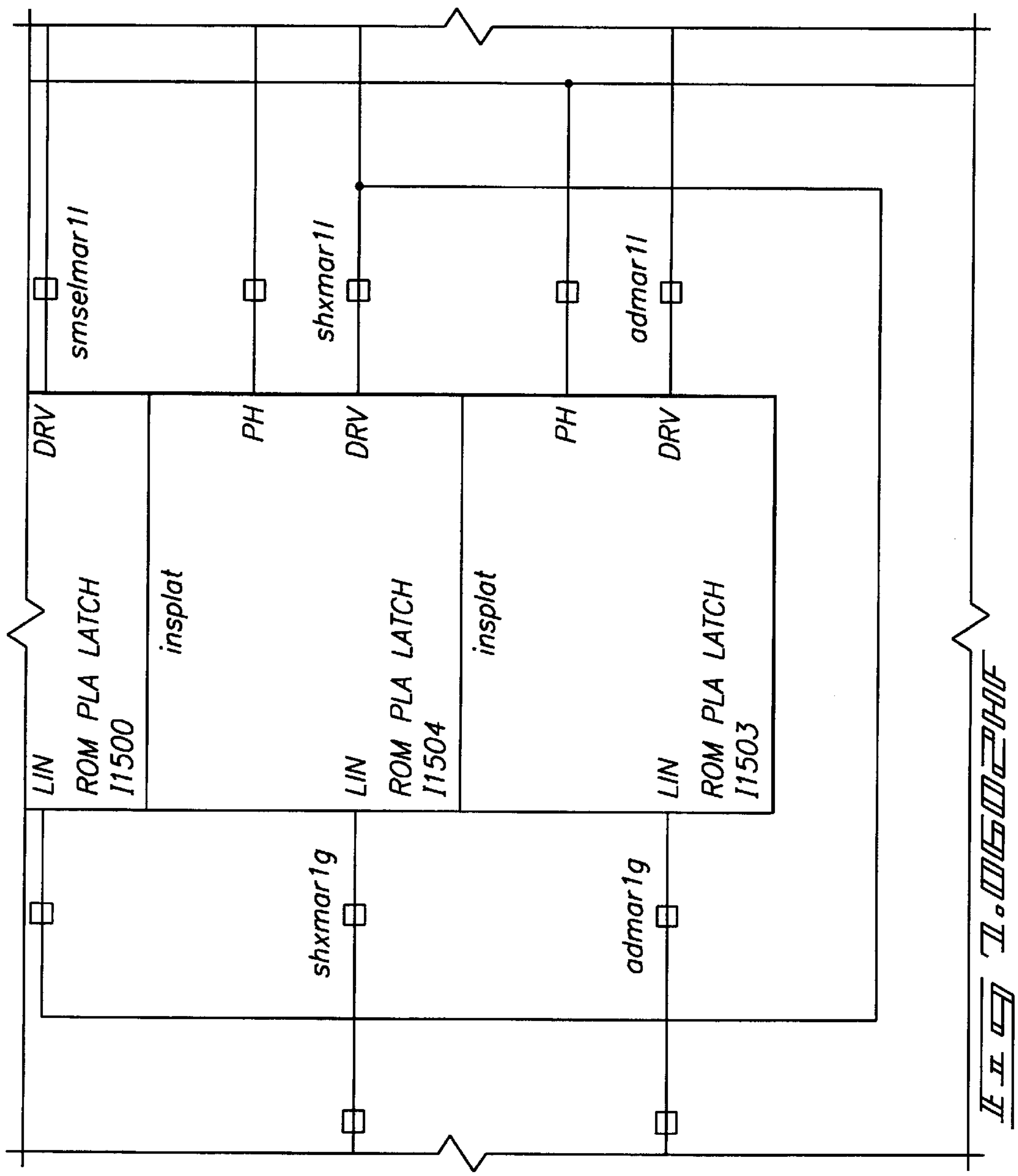
Fig. 1.0602HF

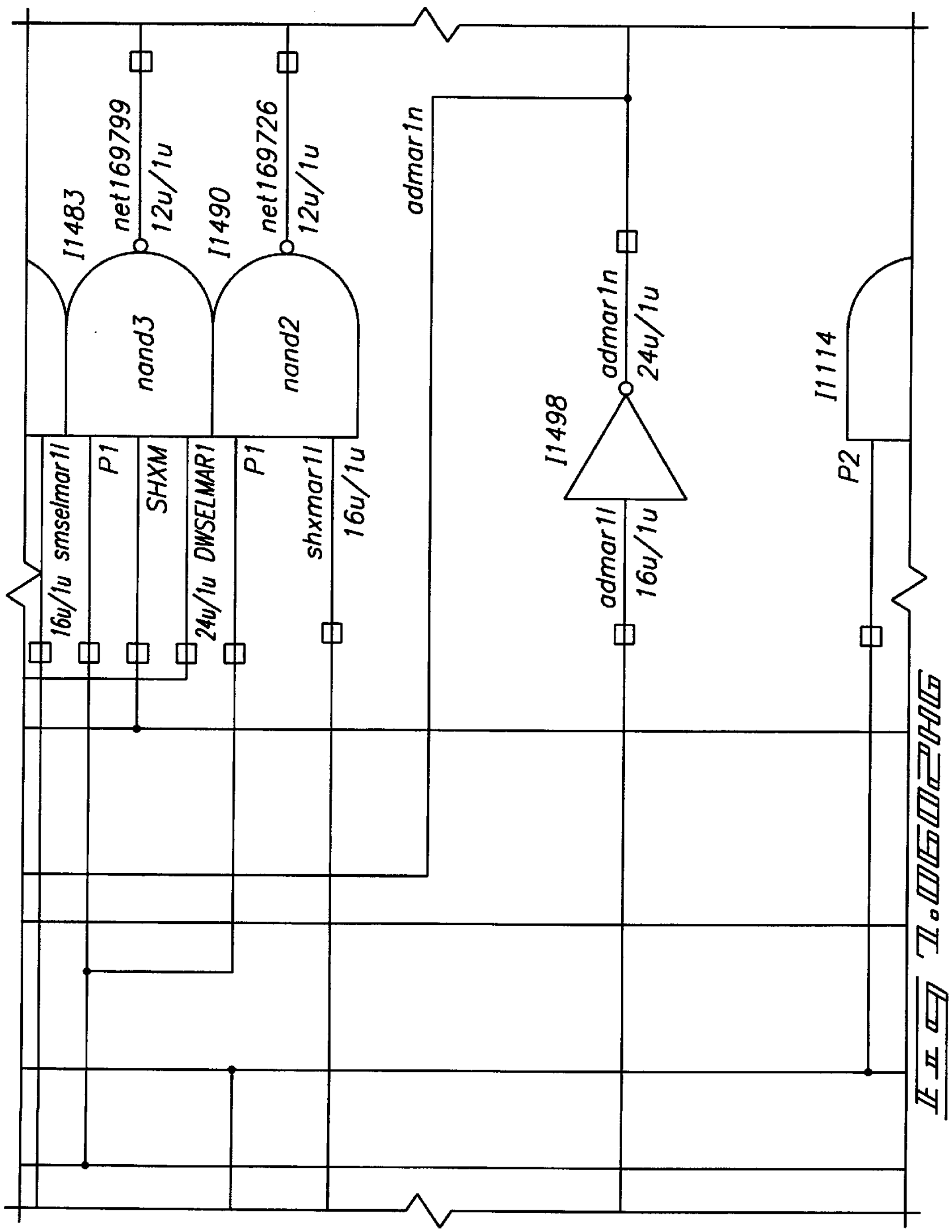
Fig. 7.0602HG

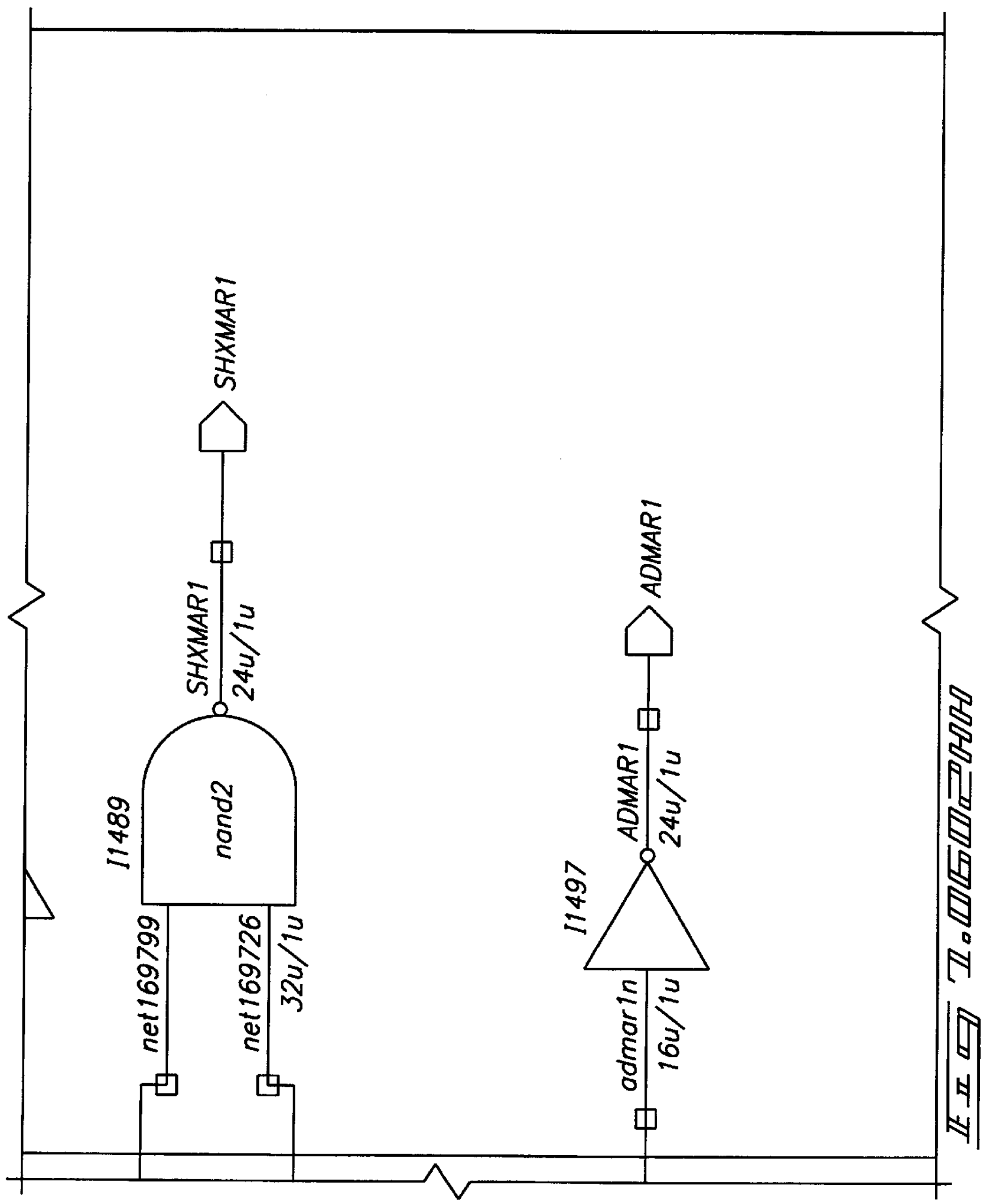
FIG. 7.060244

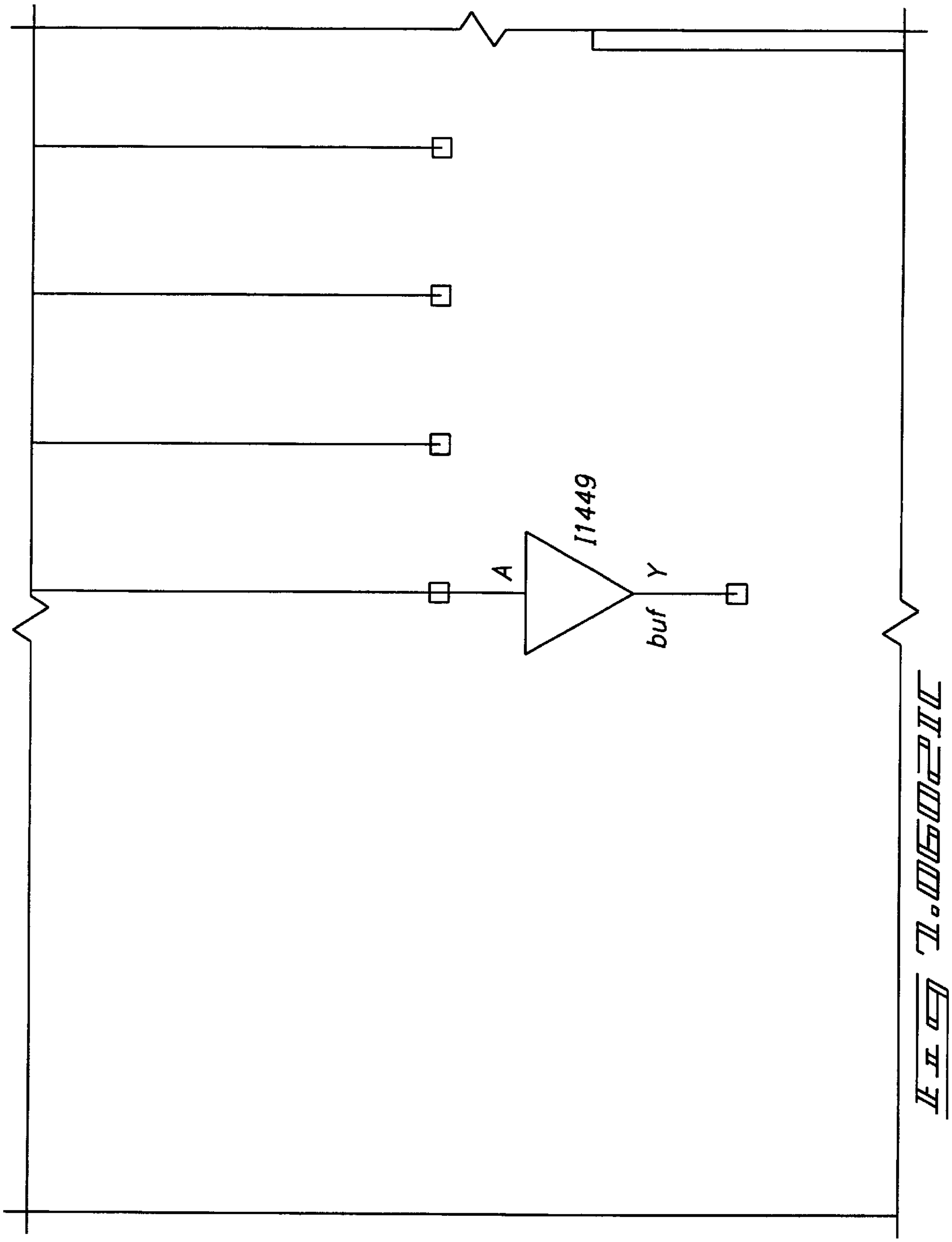
FIG. 7.0602LL

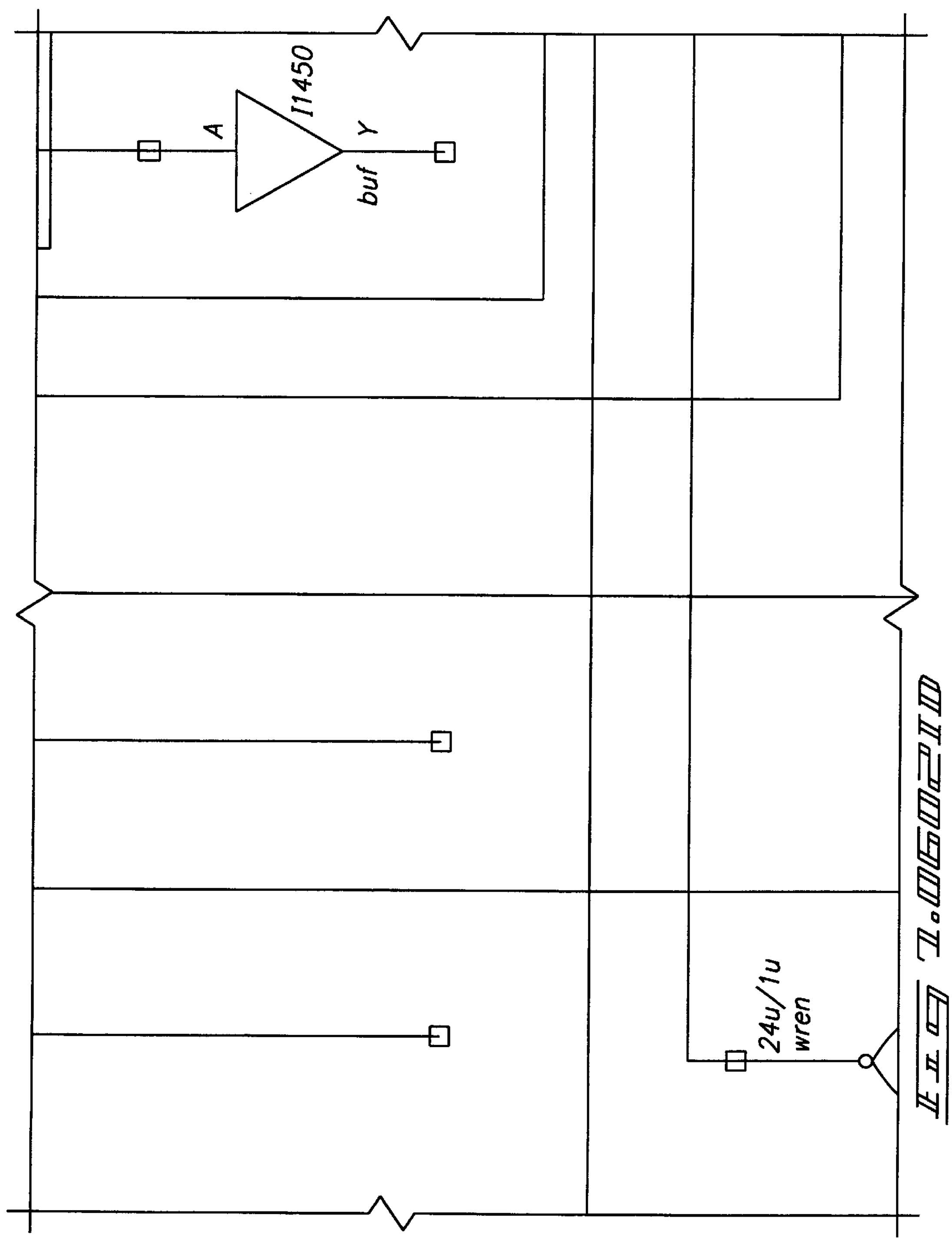
FIG. 7.0602ID

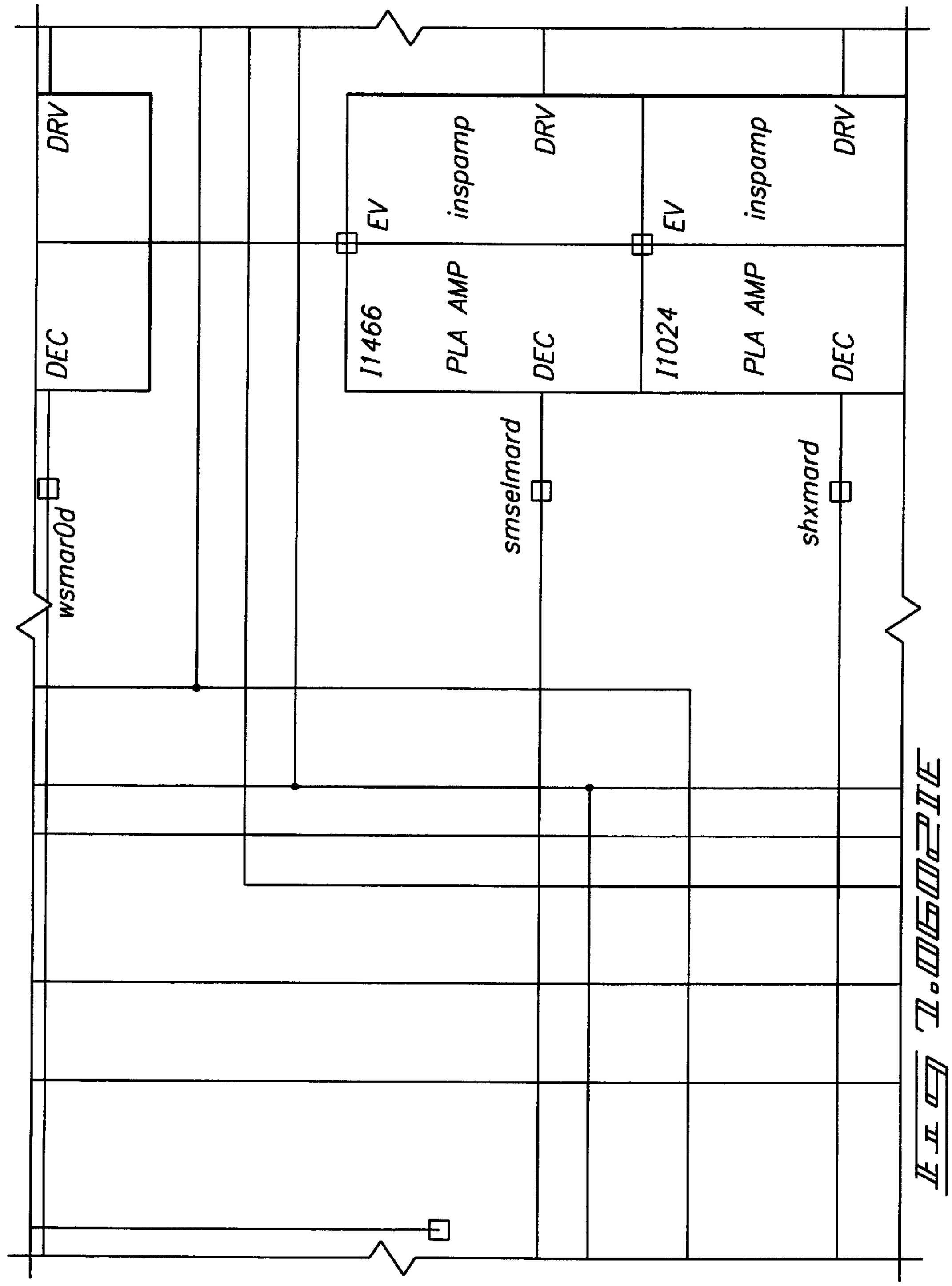
FIG. 7.06O2IE

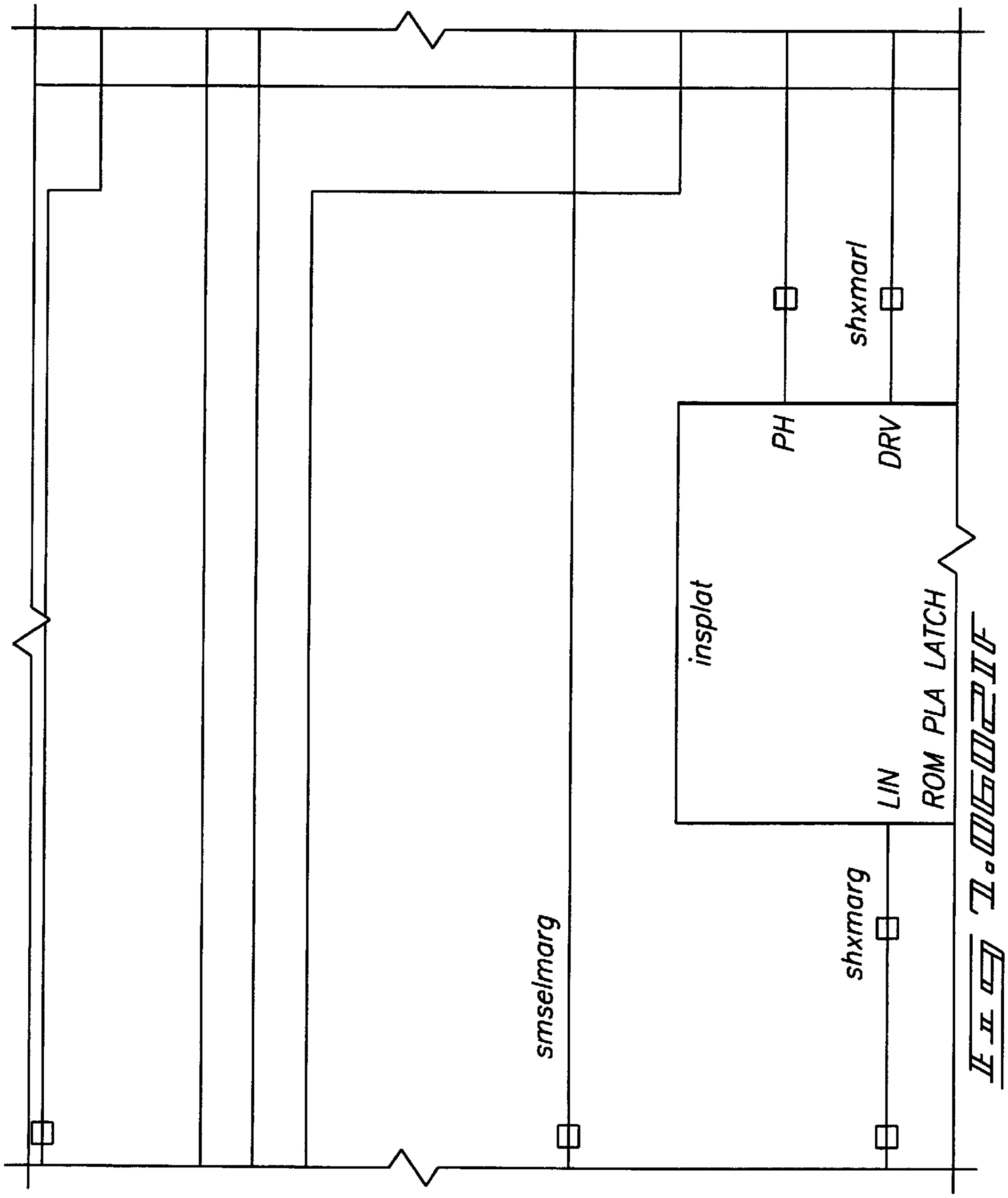
FIG. 1.0602IF

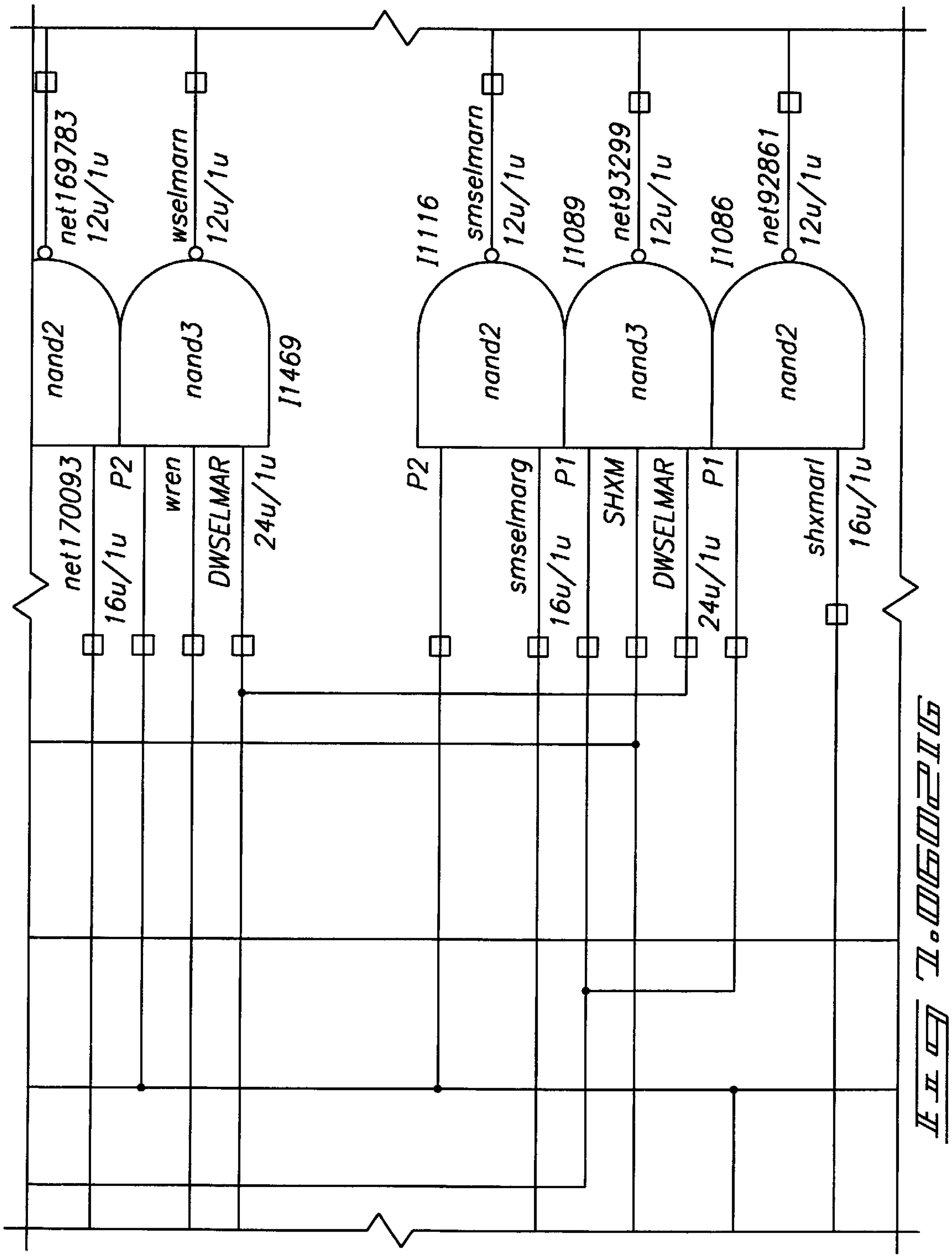
net169783
12u/1u
wselmarn
12u/1u
nand2
nand3
I1469
net170093
16u/1u
P2
wren
DWSELMAR
24u/1u
I1116
smselmarn
12u/1u
I1089
net93299
12u/1u
I1086
net92861
12u/1u
nand2
nand3
nand2
P2
smselmarg
16u/1u
P1
SHXM
DWSELMAR
24u/1u
P1
shxmarl
16u/1u

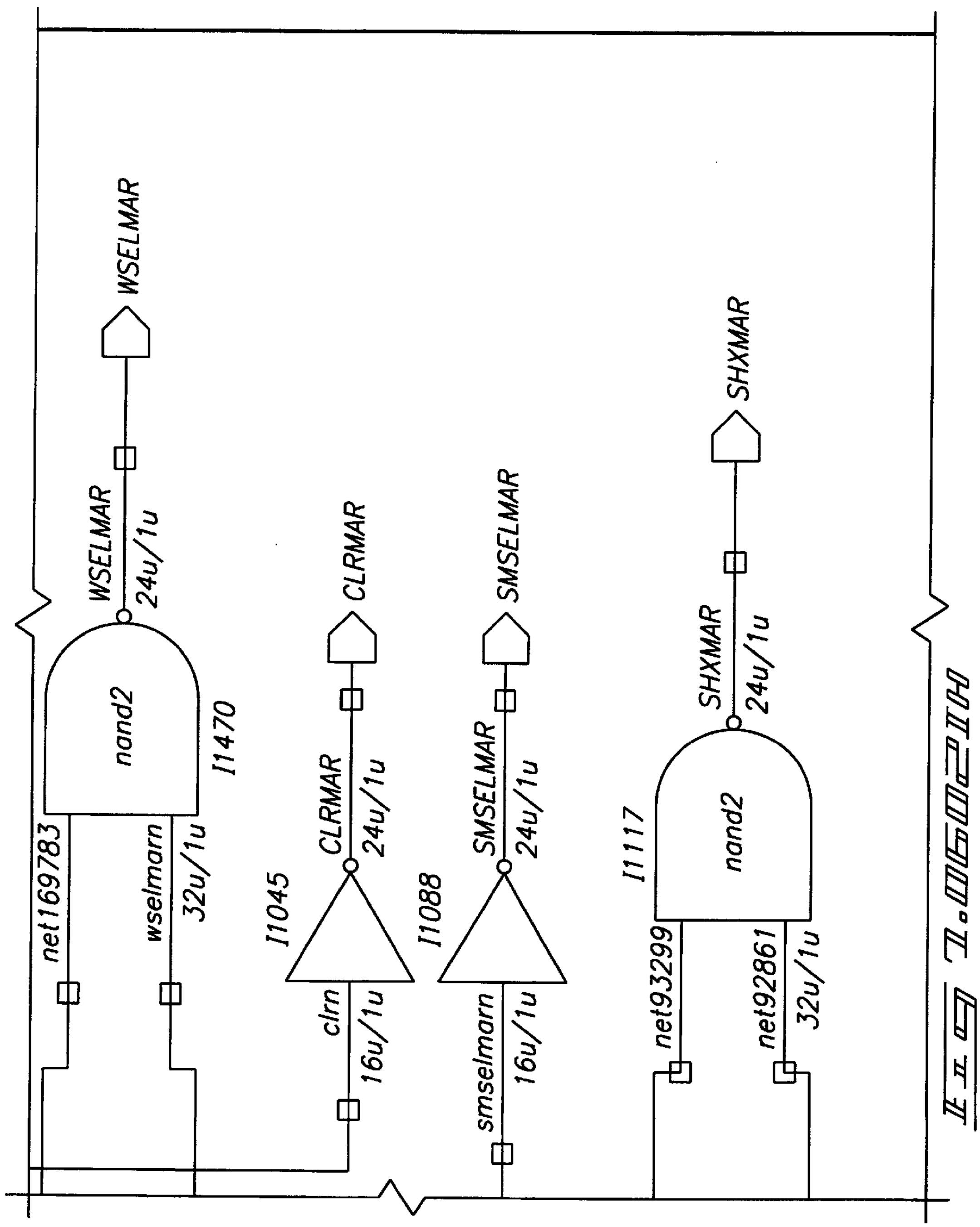
Fig. 7.0602IH

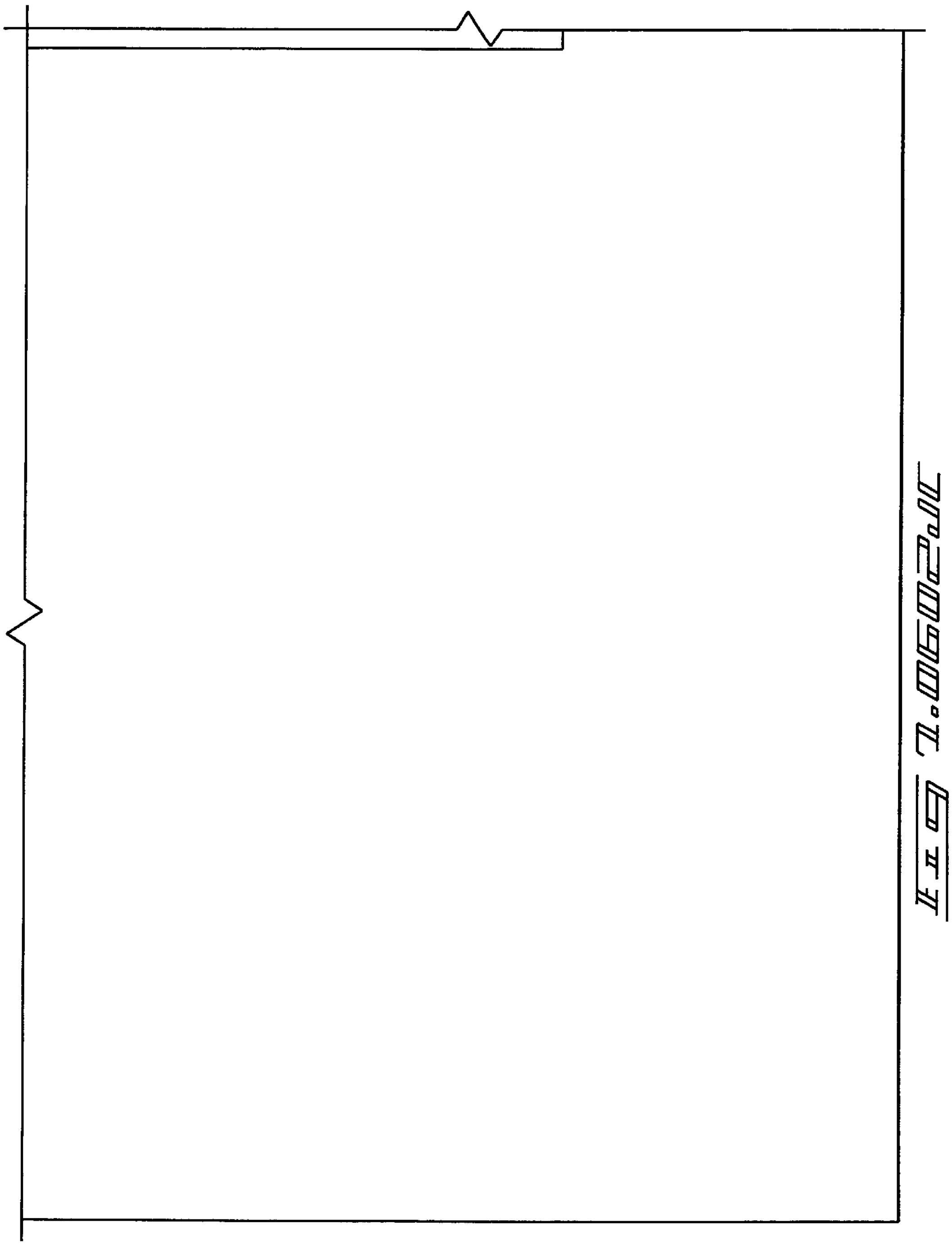
Fig. 7.0602M

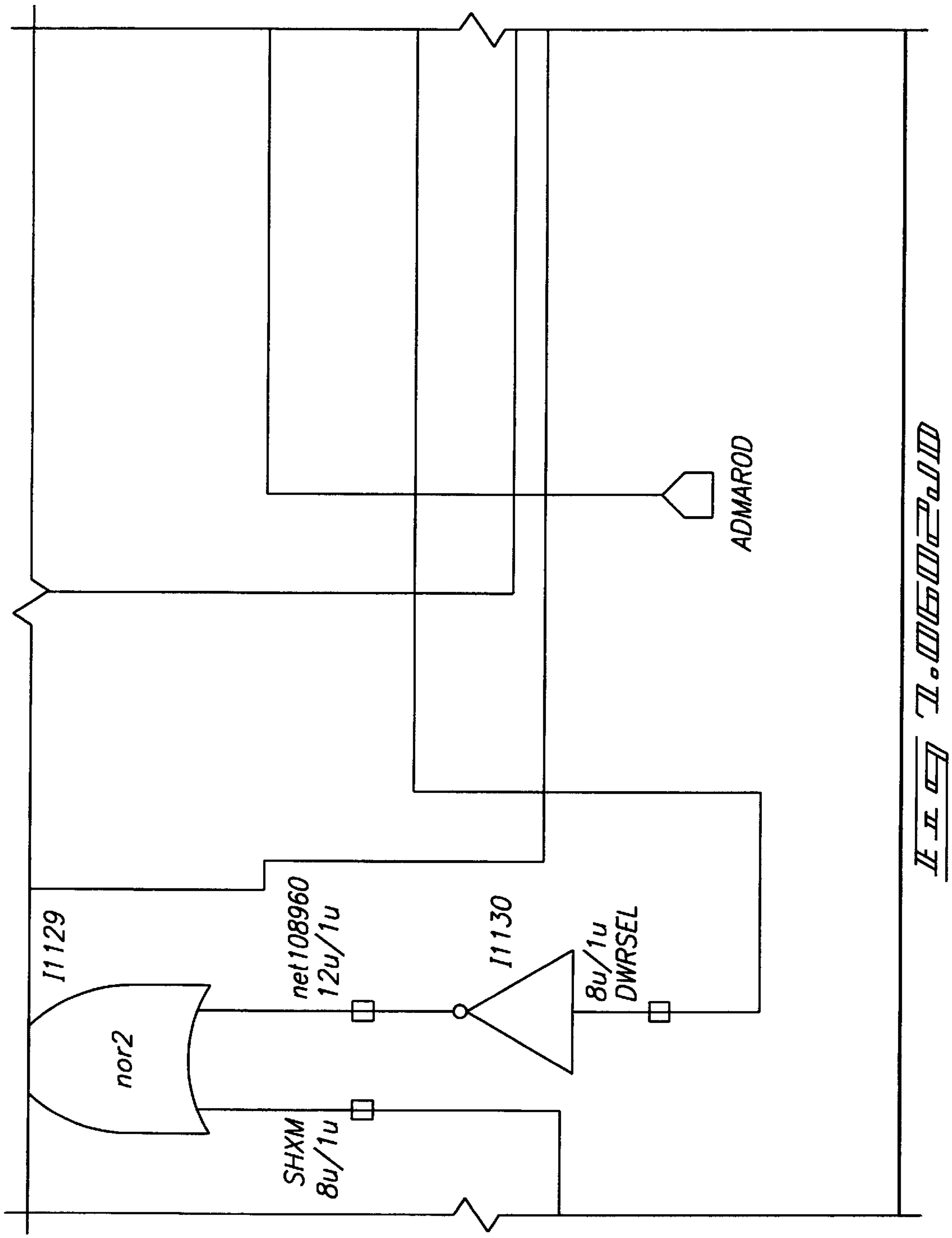
Fig. 7.0602JD

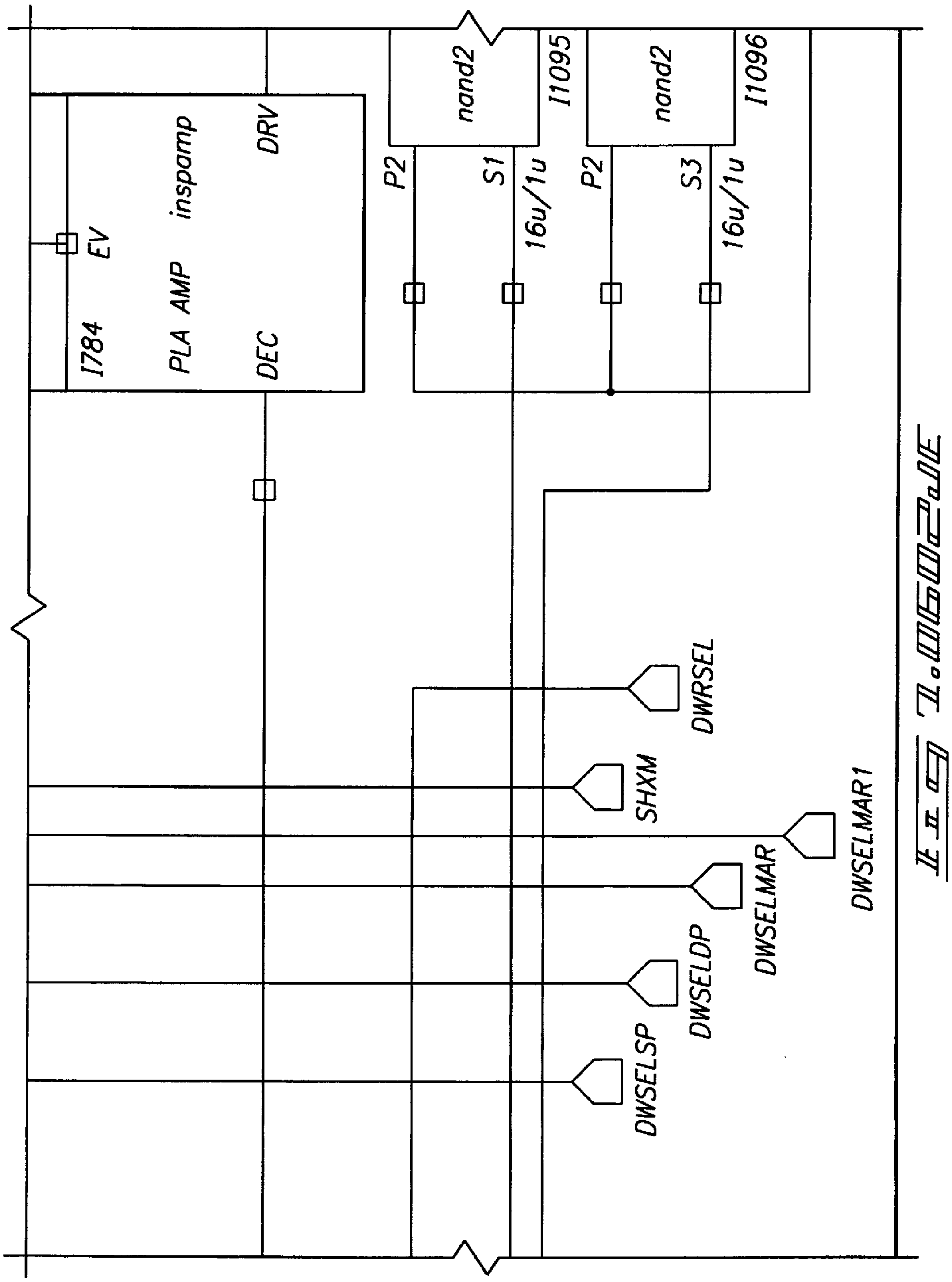
FIG. 7.060.2AE

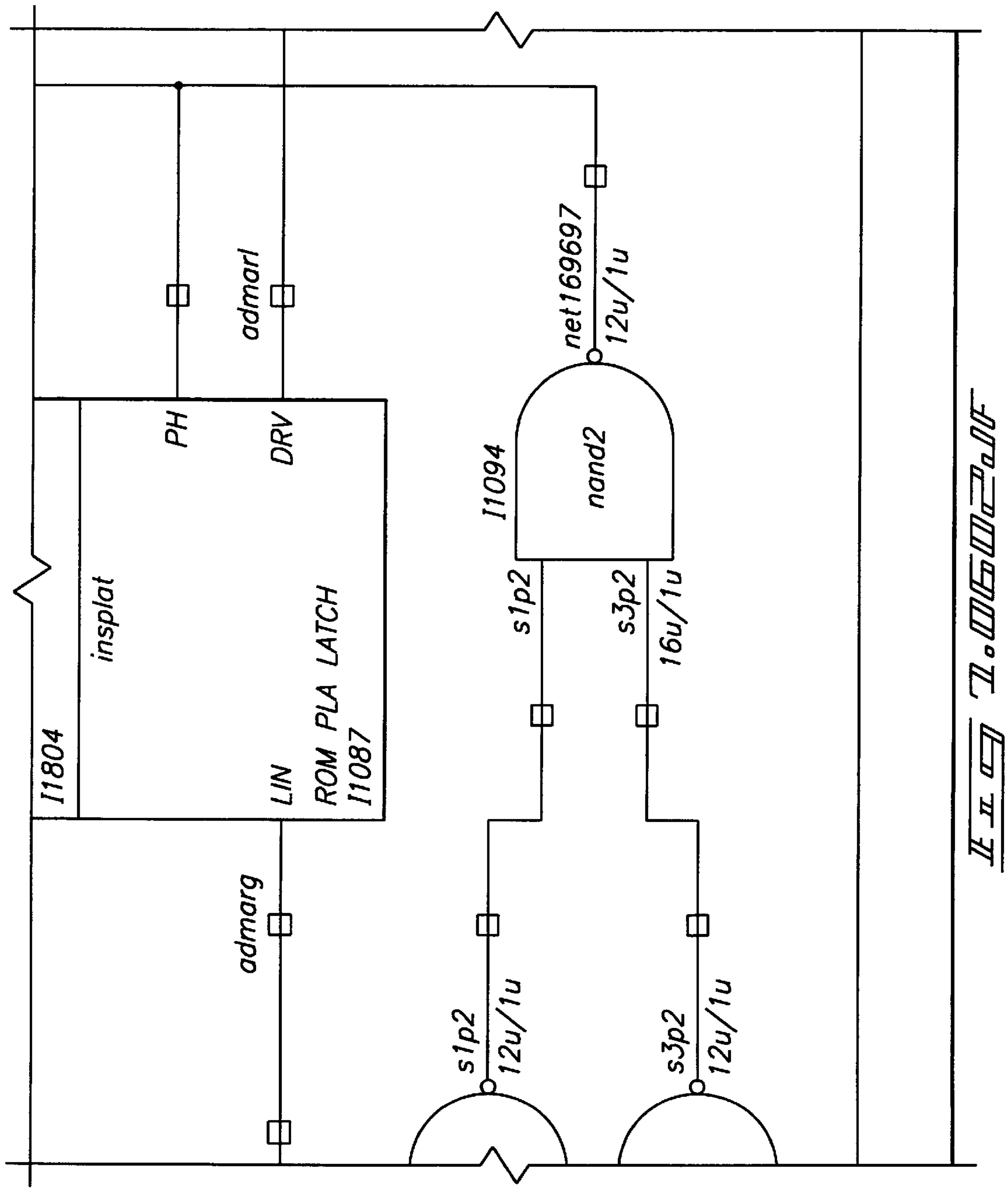
Fig. 7.0602AF

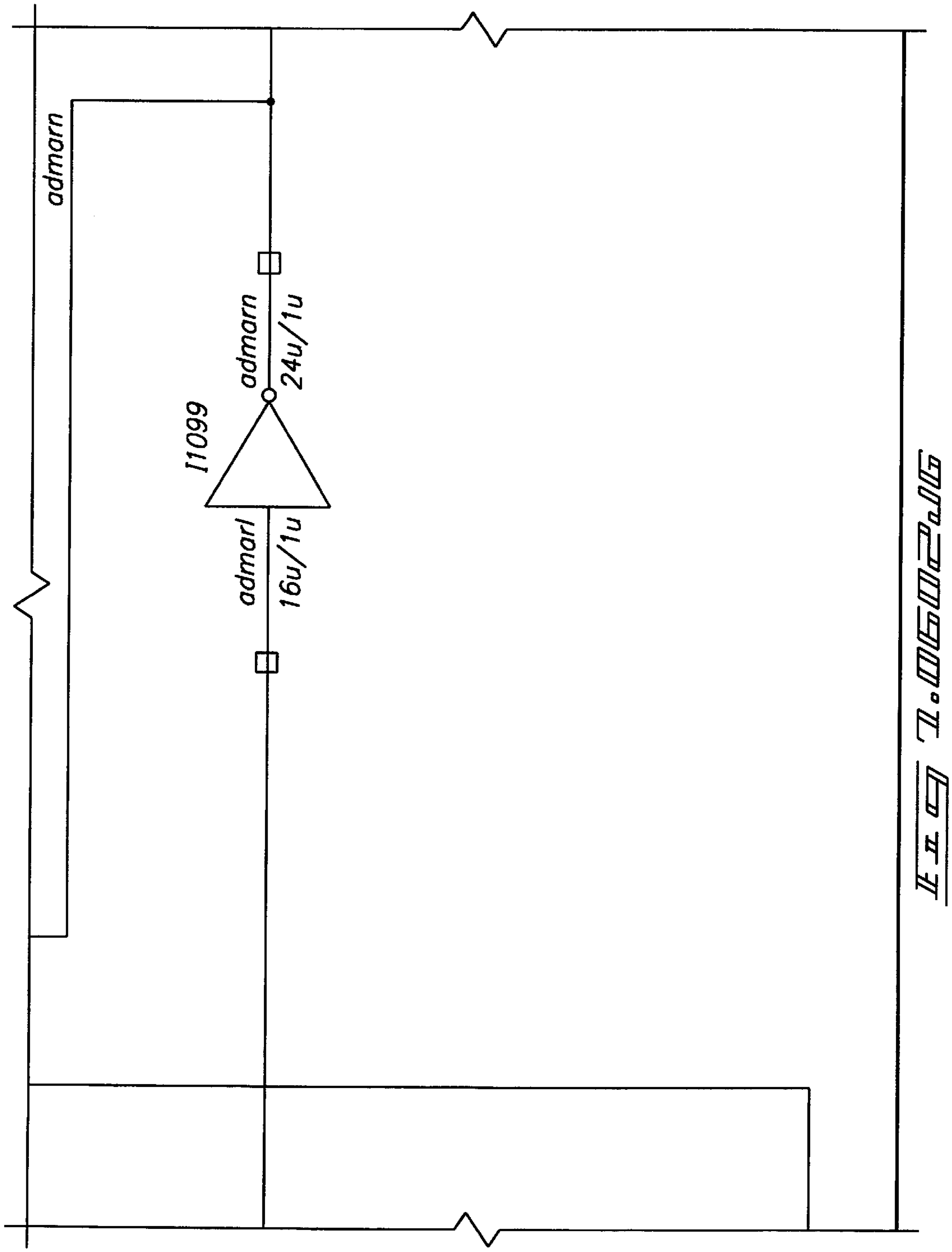
FIG. 7.0602AG

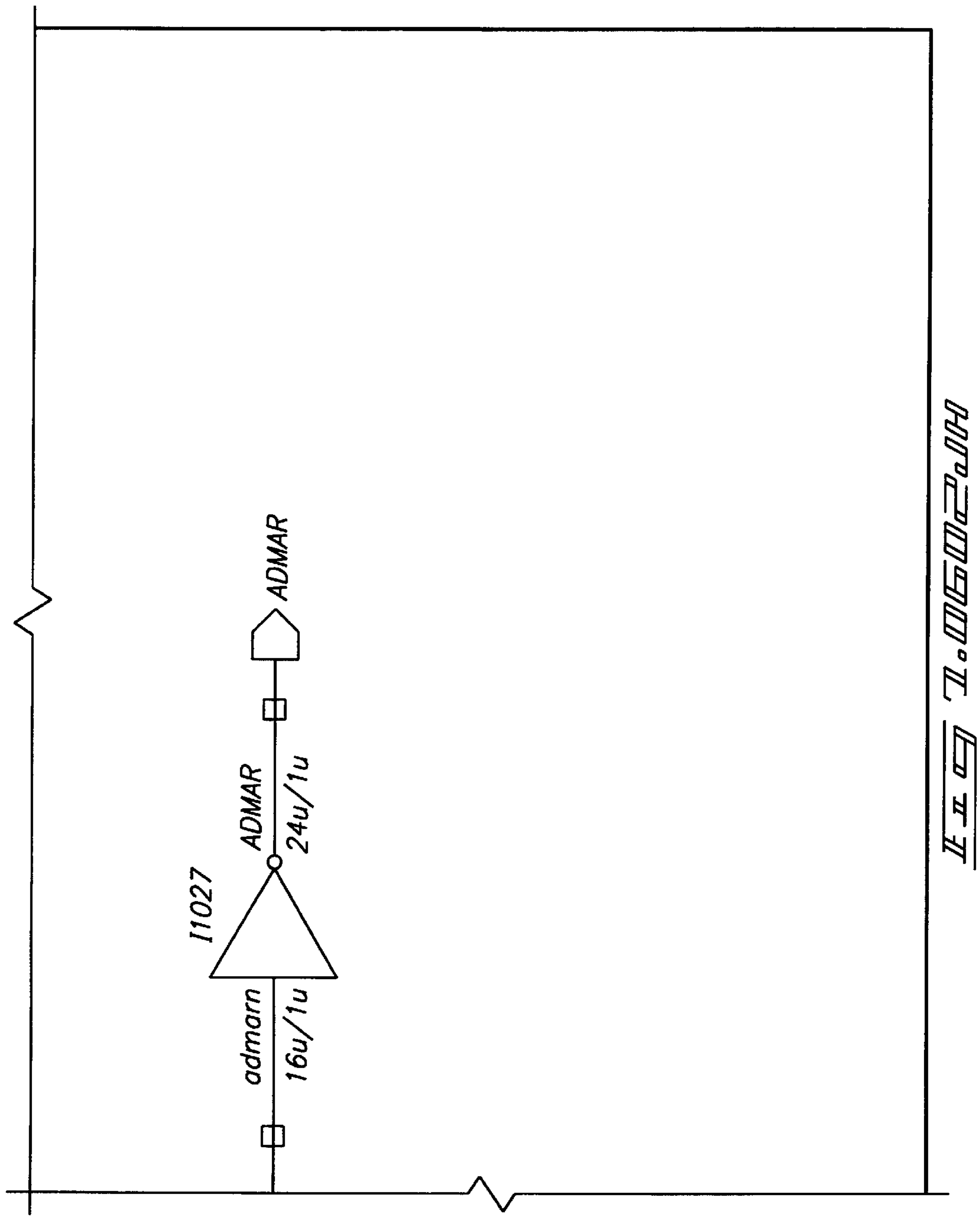
FIG. 7.0602AH

| | | | | | | | | | | |
|---|---|---|---|---|---|---|---|---|---|---|
| 7.0603AA | 7.0603AB | 7.0603AC | 7.0603AD | 7.0603AE | 7.0603AF | | 7.0603AH | 7.0603AI | 7.0603AJ | |
| 7.0603BA | 7.0603BB | 7.0603BC | 7.0603BD | 7.0603BE | 7.0603BF | 7.0603BG | 7.0603BH | 7.0603BI | 7.0603BJ | 7.0603BK |
| 7.0603CA | 7.0603CB | 7.0603CC | 7.0603CD | 7.0603CE | 7.0603CF | 7.0603CG | 7.0603CH | 7.0603CI | 7.0603CJ | |
| 7.0603DA | 7.0603DB | 7.0603DC | 7.0603DD | 7.0603DE | 7.0603DF | 7.0603DG | 7.0603DH | 7.0603DI | 7.0603DJ | |
| 7.0603EA | 7.0603EB | 7.0603EC | 7.0603ED | 7.0603EE | 7.0603EF | 7.0603EG | 7.0603EH | 7.0603EI | 7.0603EJ | |
| 7.0603FA | 7.0603FB | 7.0603FC | 7.0603FD | 7.0603FE | 7.0603FF | 7.0603FG | 7.0603FH | 7.0603FI | 7.0603FJ | |
| 7.0603GA | 7.0603GB | 7.0603GC | 7.0603GD | 7.0603GE | 7.0603GF | 7.0603GG | 7.0603GH | 7.0603GI | 7.0603GJ | |
| 7.0603HA | 7.0603HB | 7.0603HC | 7.0603HD | 7.0603HE | 7.0603HF | 7.0603HG | 7.0603HH | 7.0603HI | 7.0603HJ | |
| 7.0603IA | 7.0603IB | 7.0603IC | 7.0603ID | 7.0603IE | 7.0603IF | 7.0603IG | 7.0603IH | 7.0603II | 7.0603IJ | |
| | | 7.0603JC | 7.0603JD | 7.0603JE | 7.0603JF | 7.0603JG | | 7.0603JI | | |

Fig. 7.0603

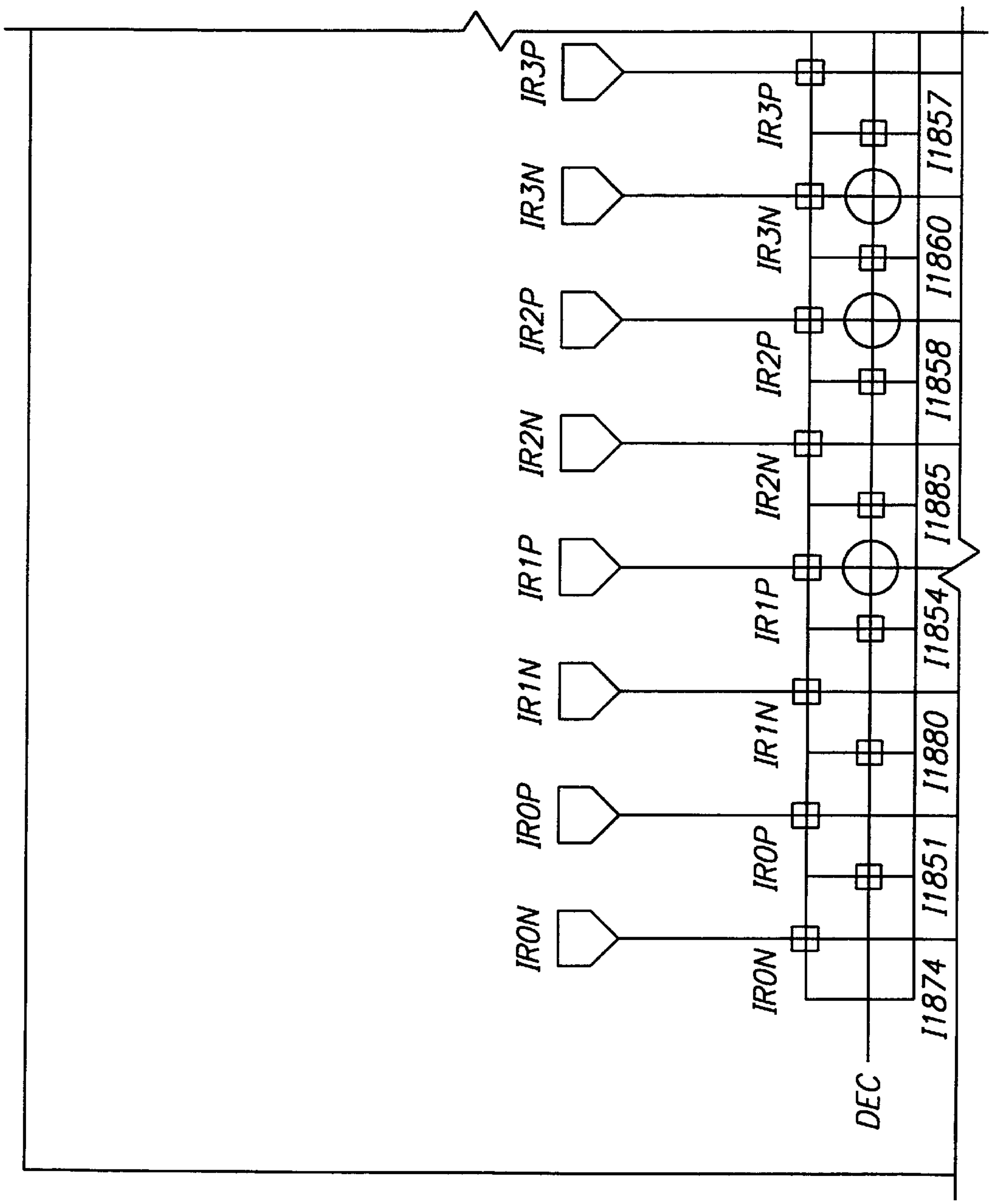
Fig. 7.060EAA

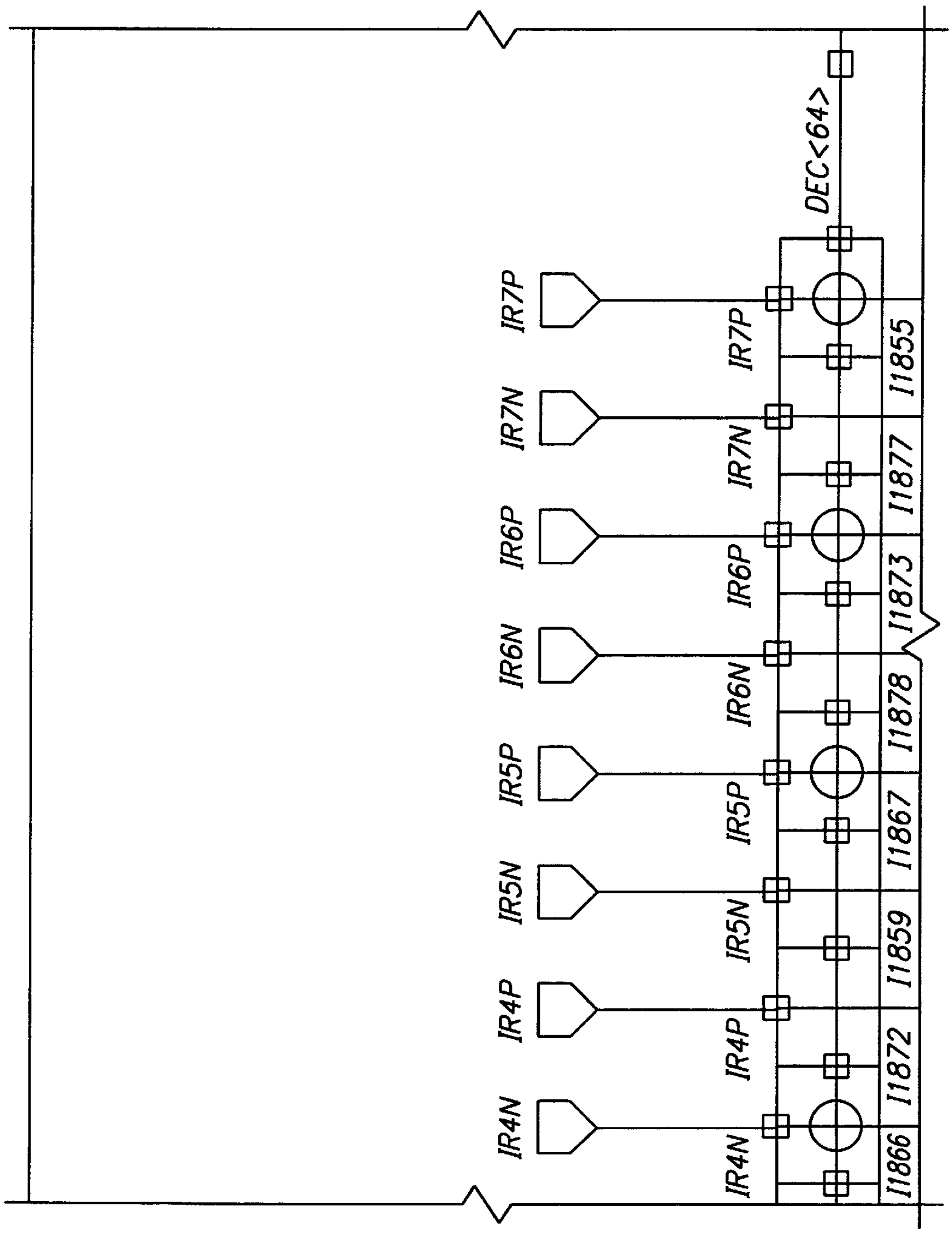
FIG. 7.0693AB

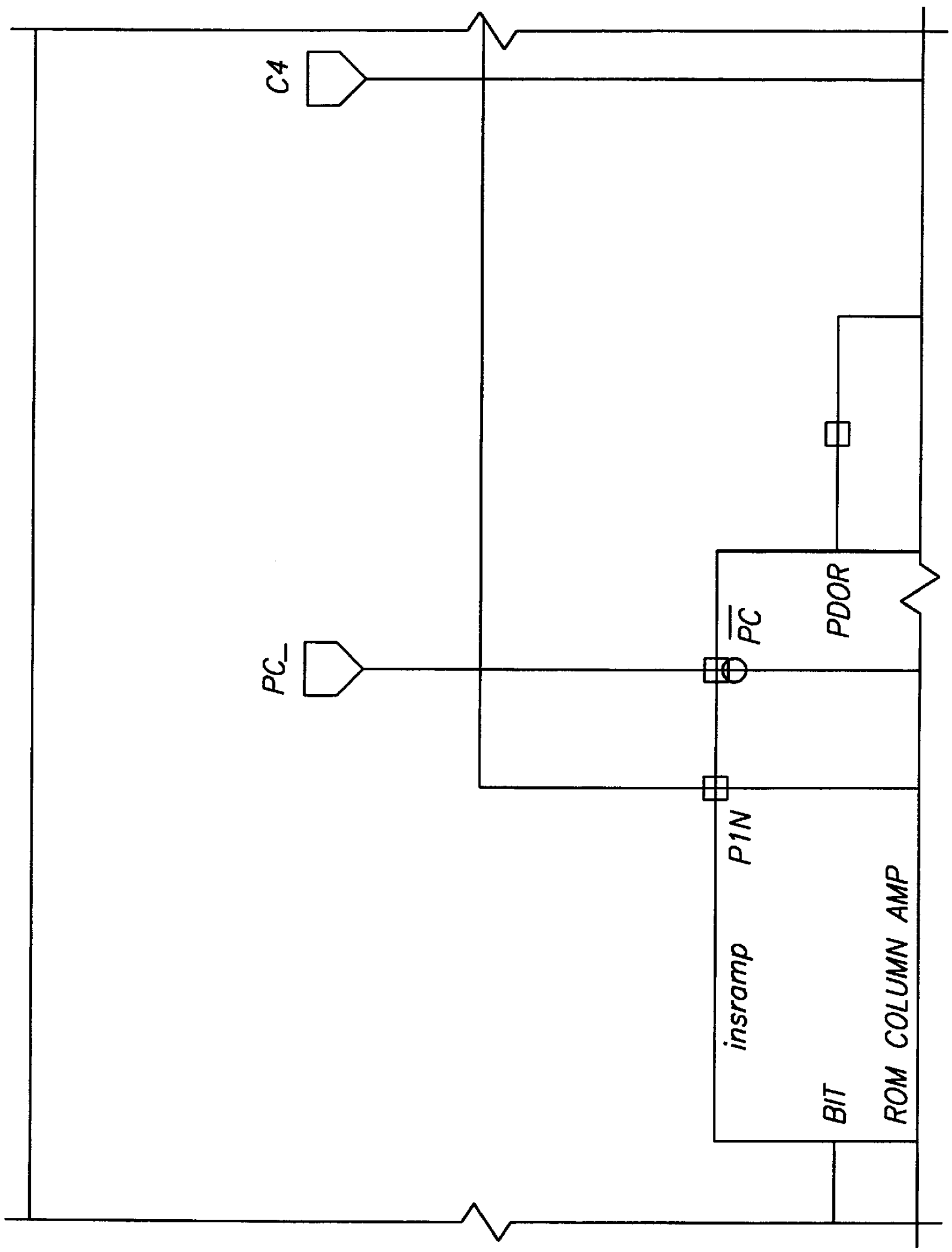
FIG. 7.0603AC

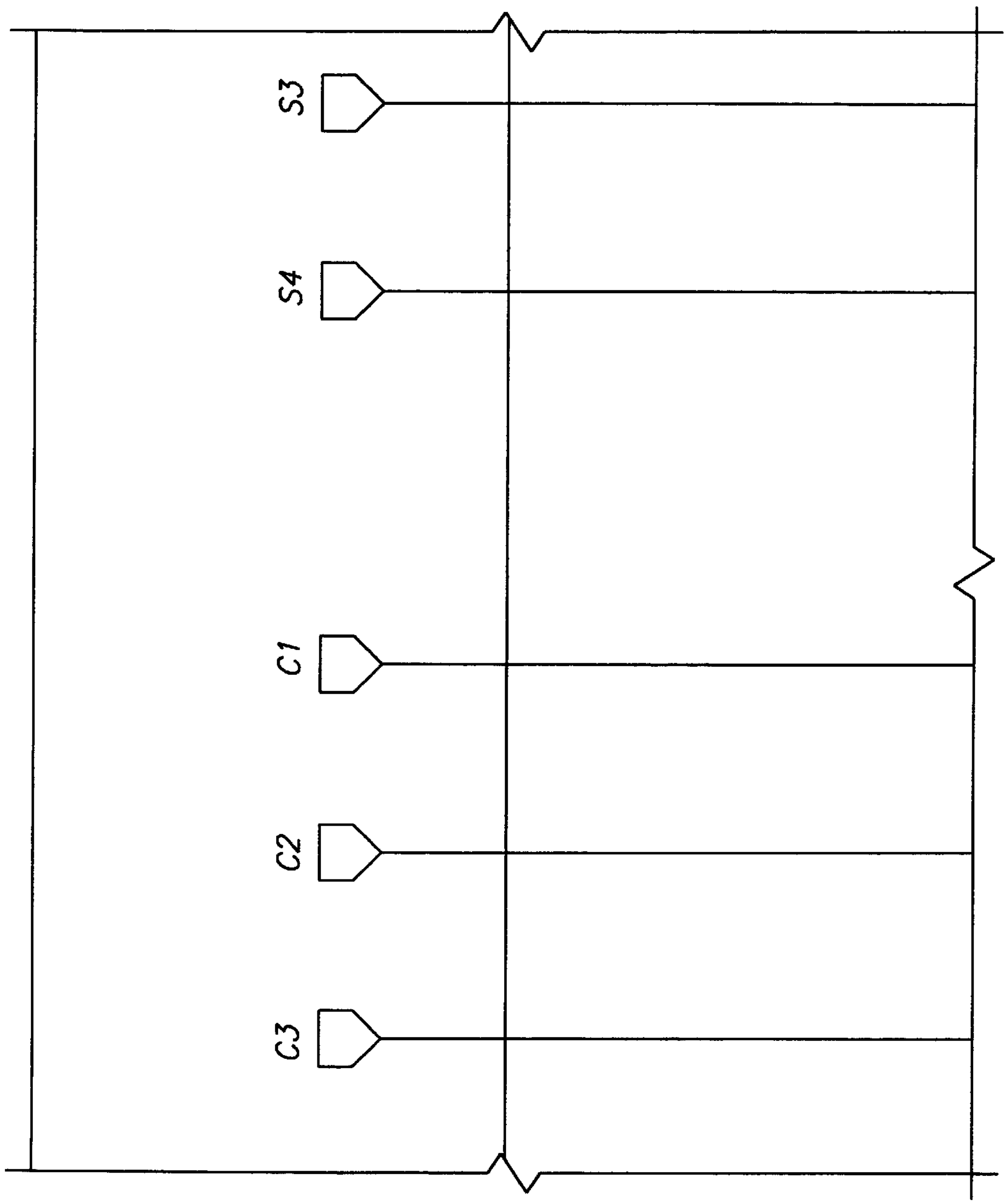
Fig. 7.0603AD

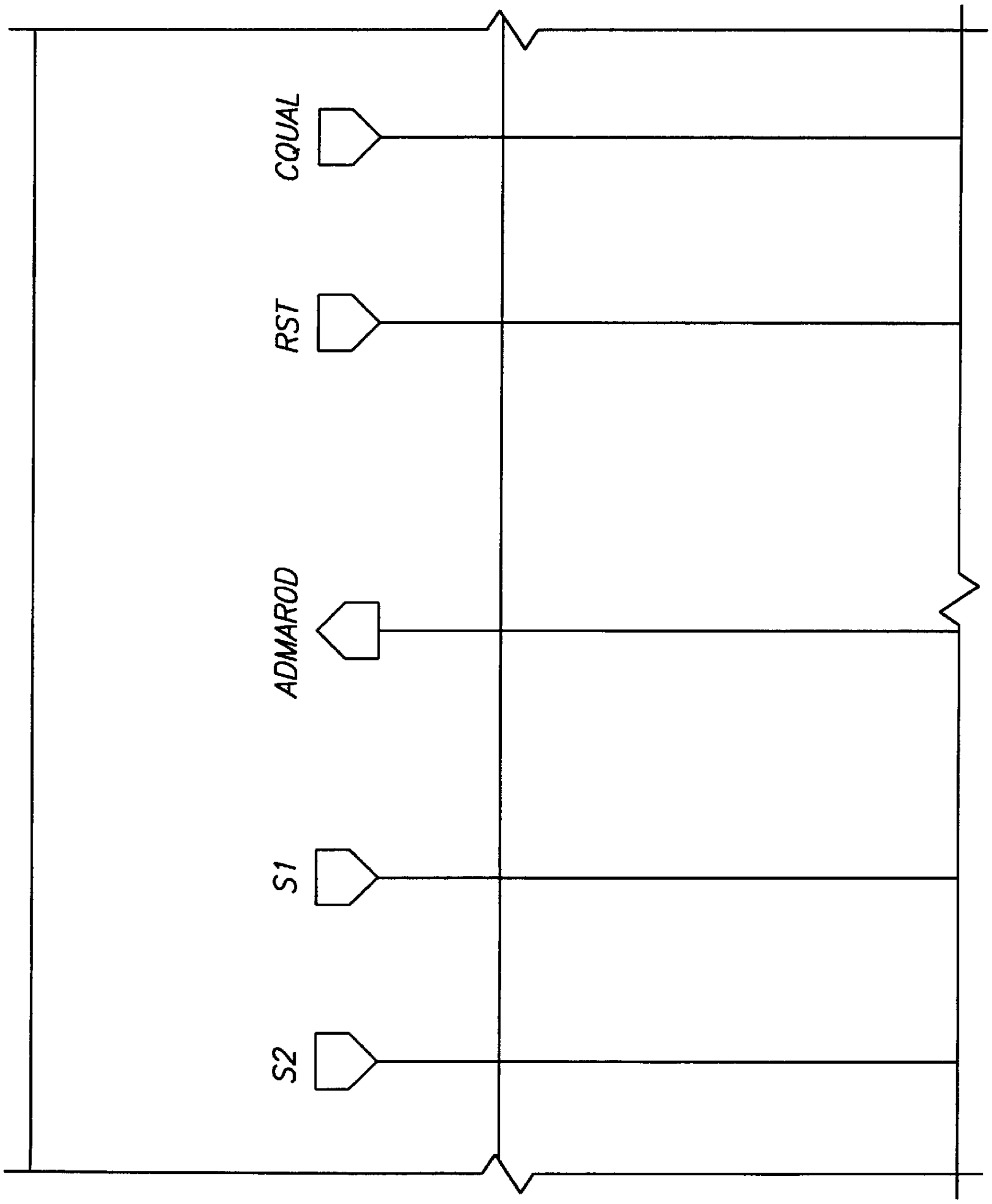
Fig. 7.0603AE

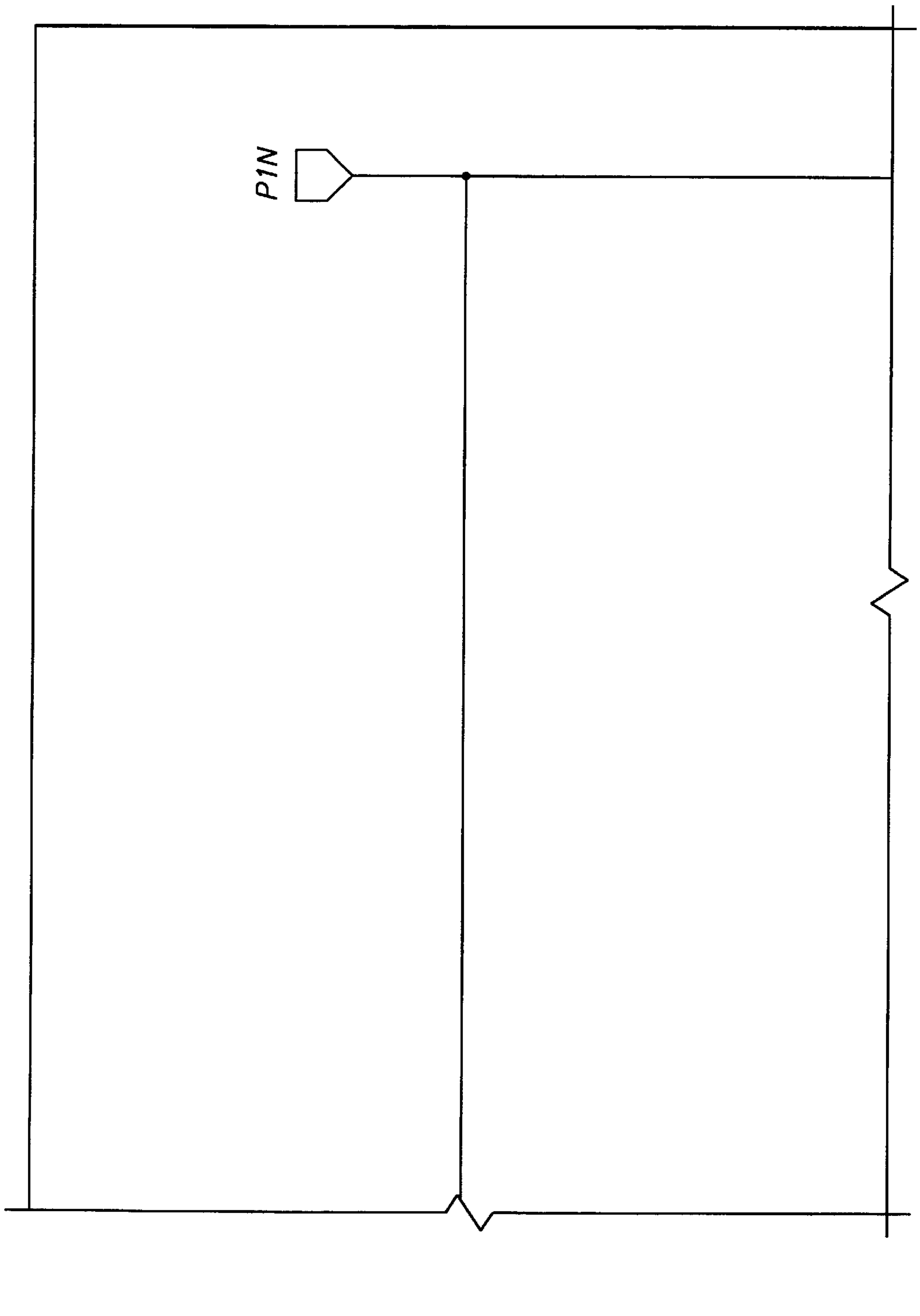
FIG. 7.0603AF

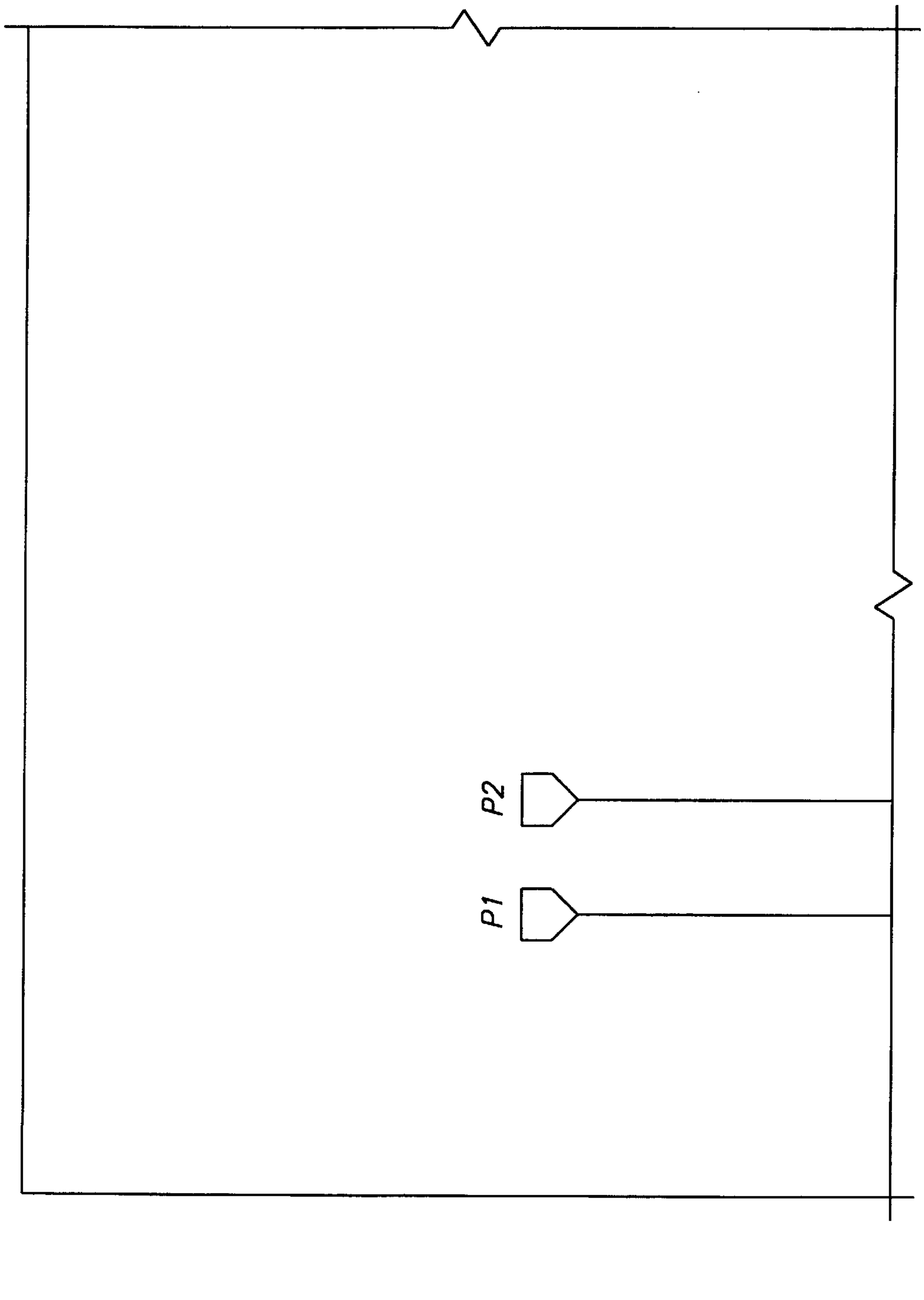
FIG. 7.0690EAA

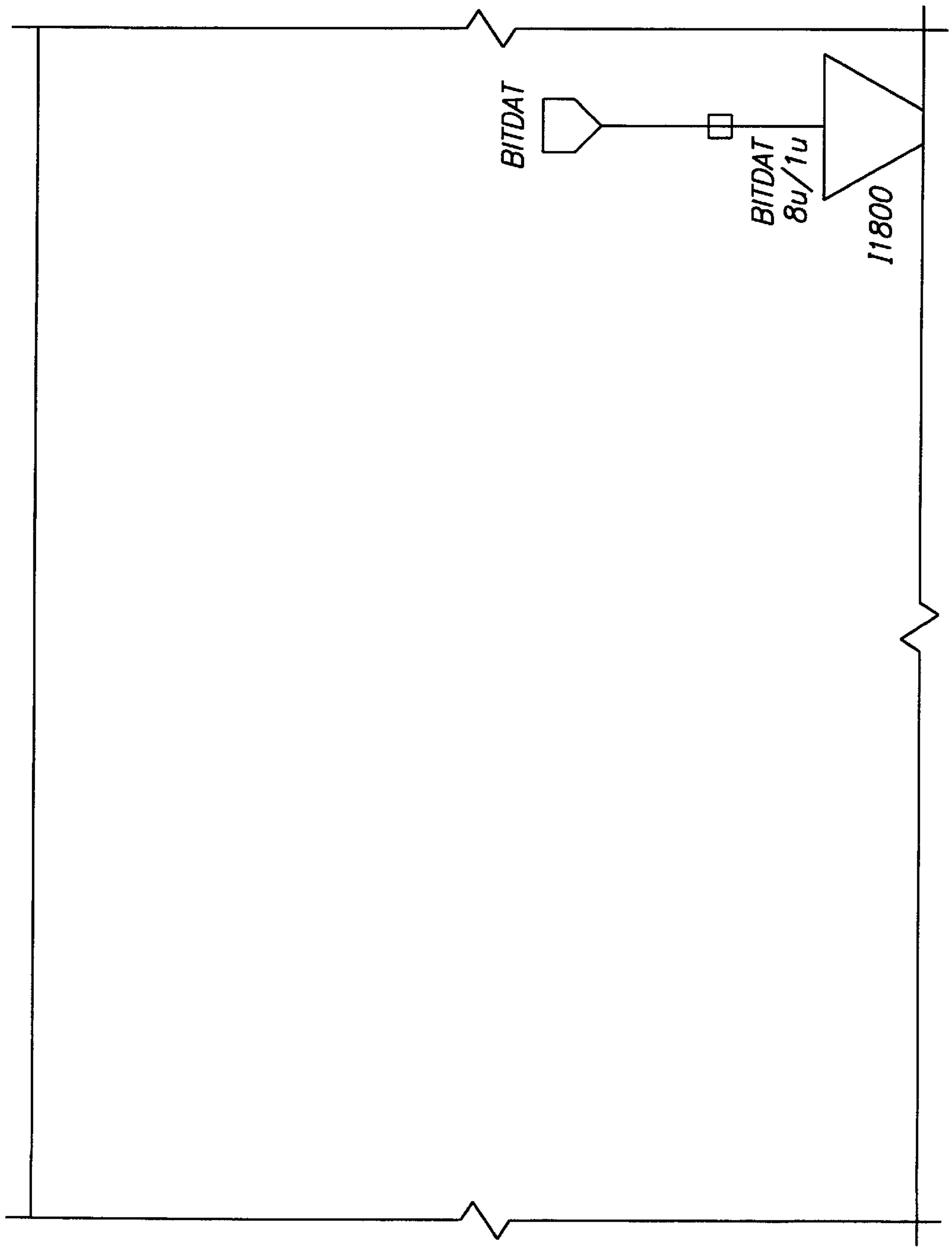
Fig. 7.0603AI

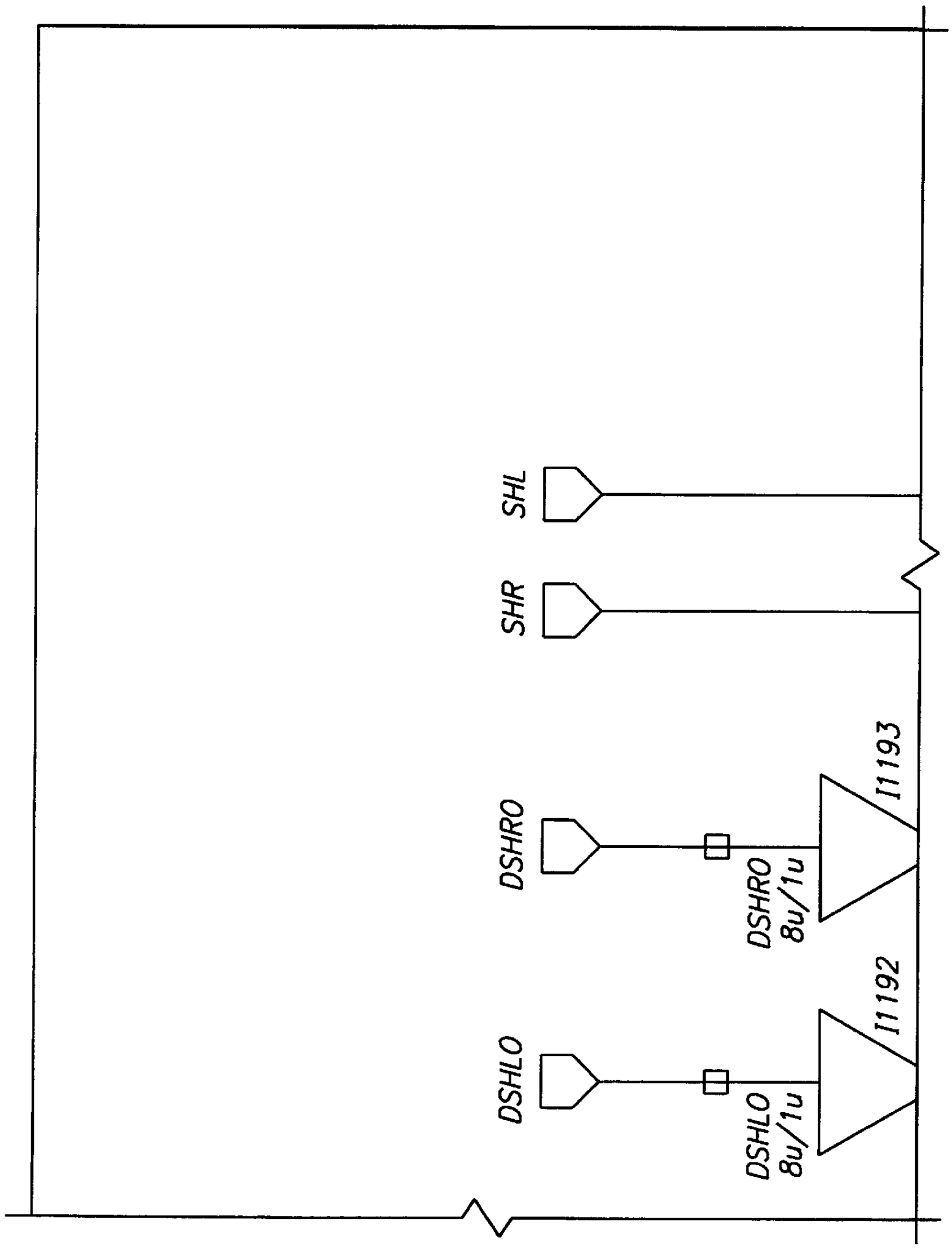
FIG. 1.0603AJ

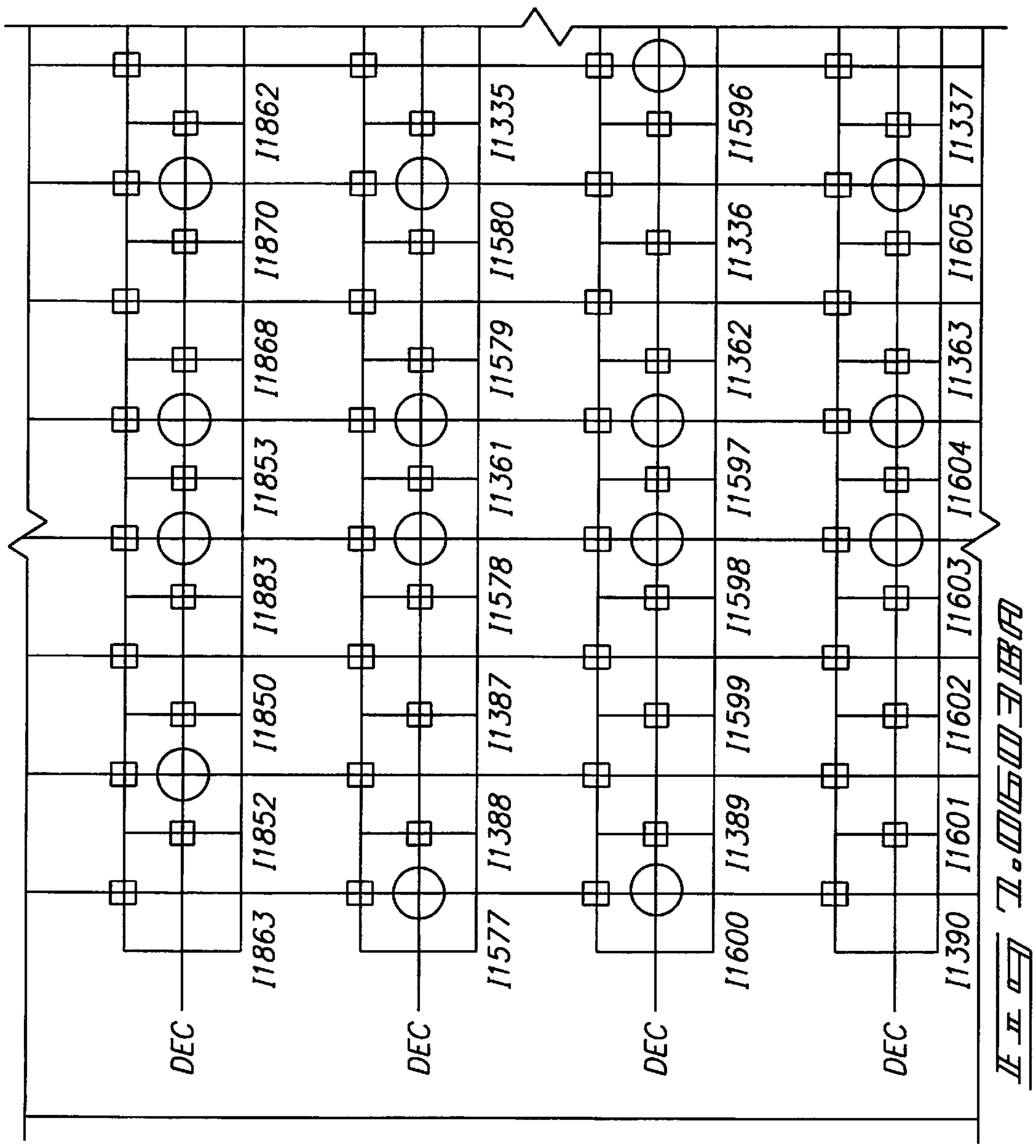
Fig. 7.0603BA

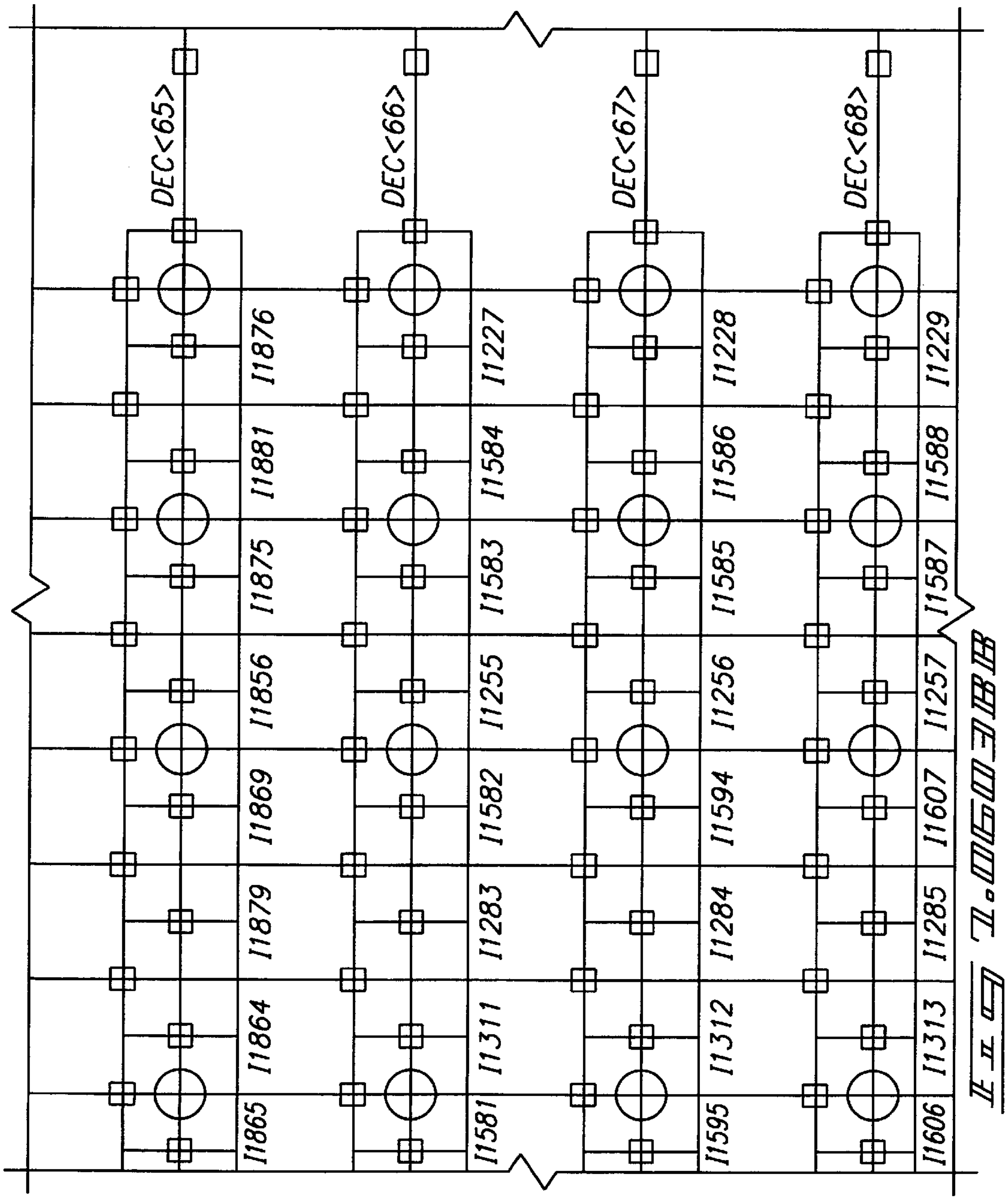
FIG. 1.0603BB

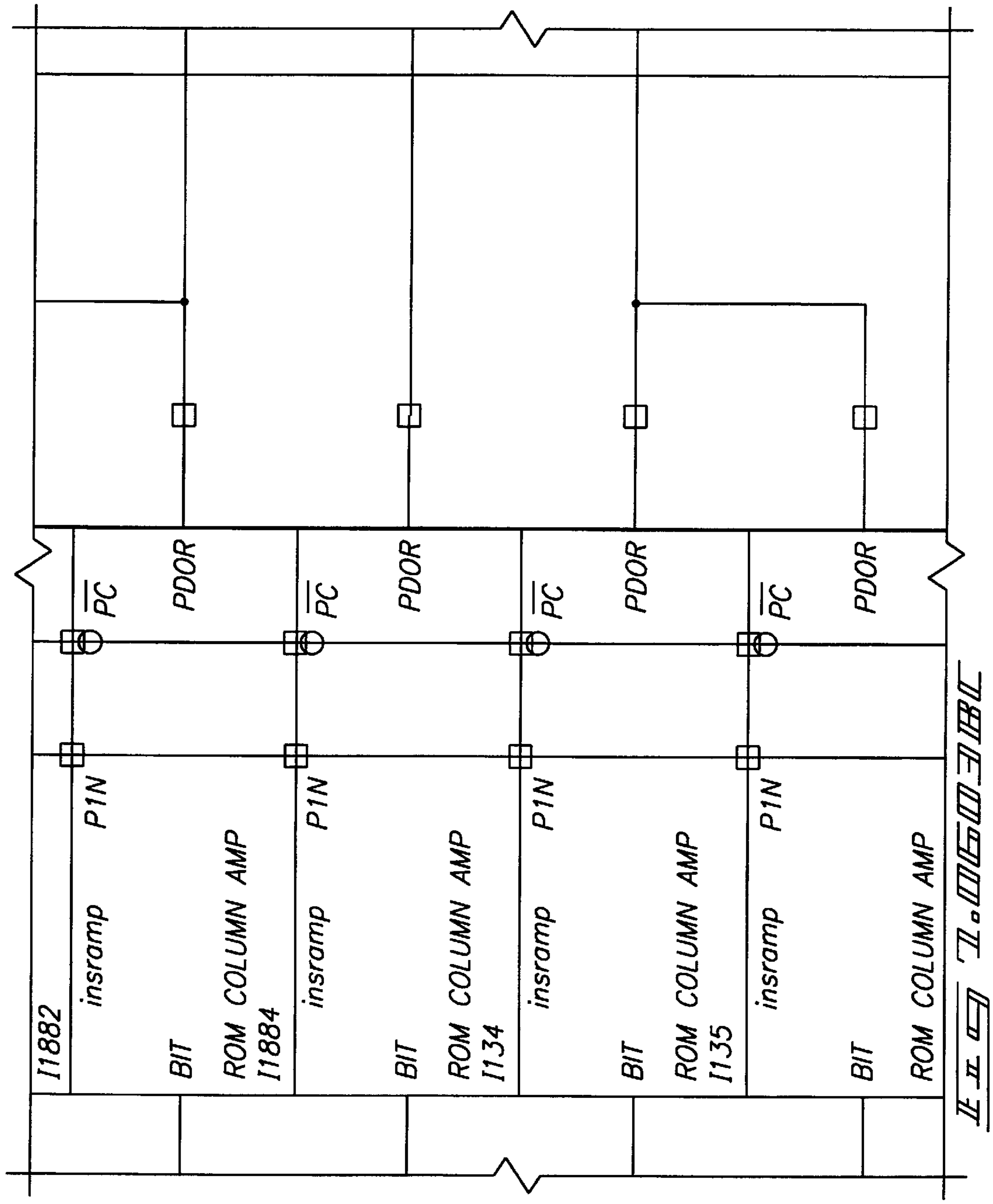
Fig. 7.0603BC

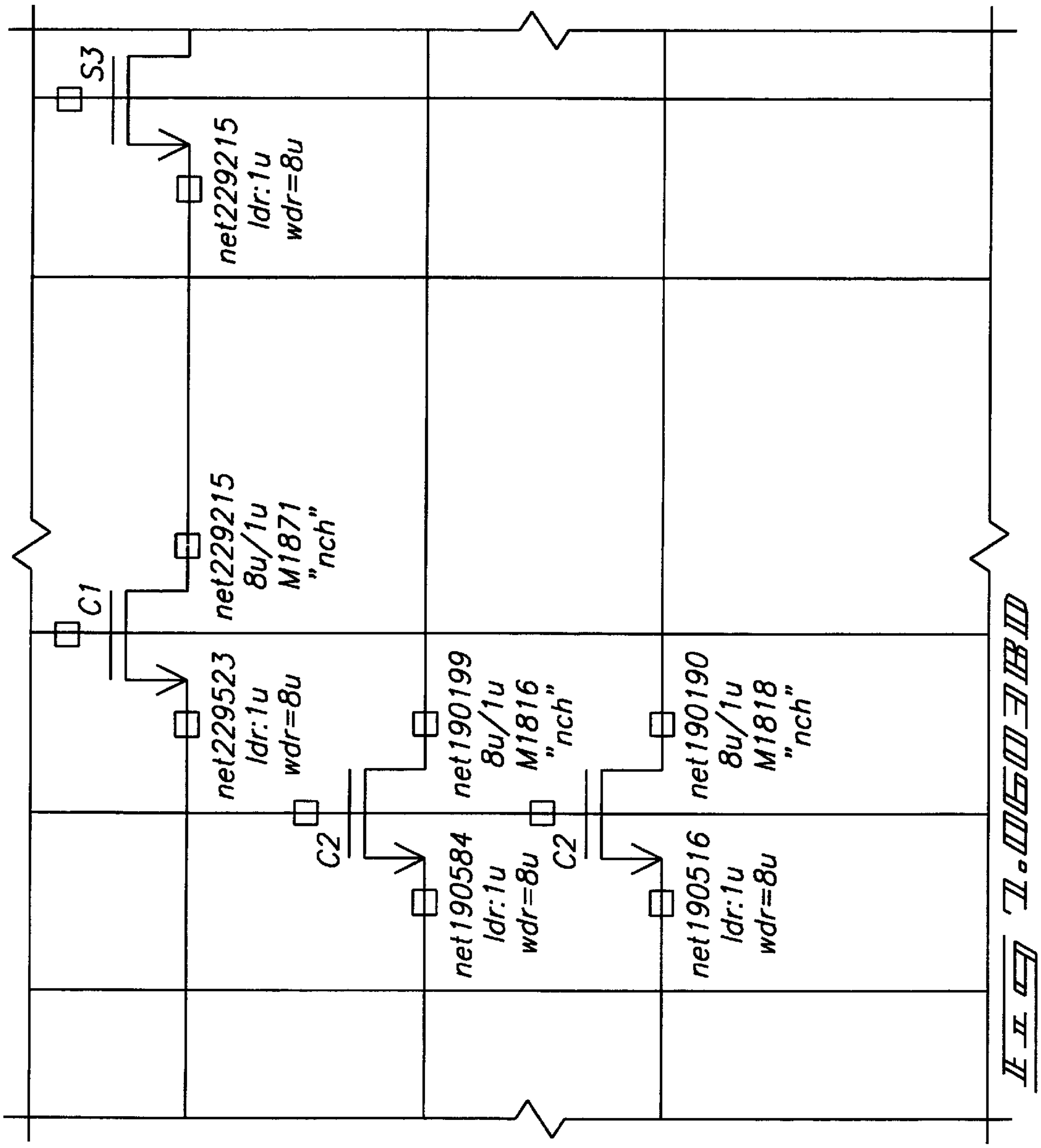
Fig. 7.0603BD

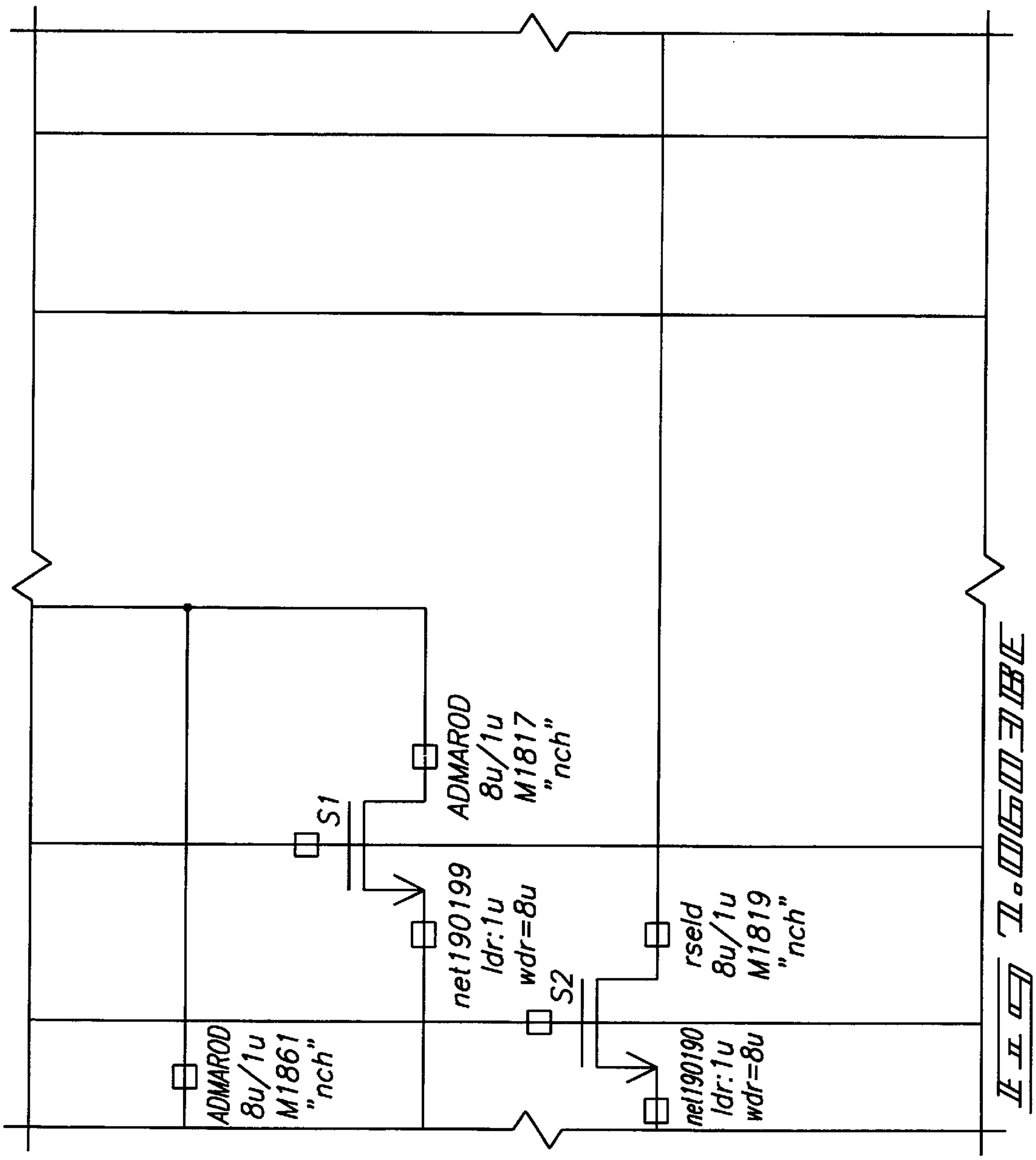
FIG. 7.0603BE

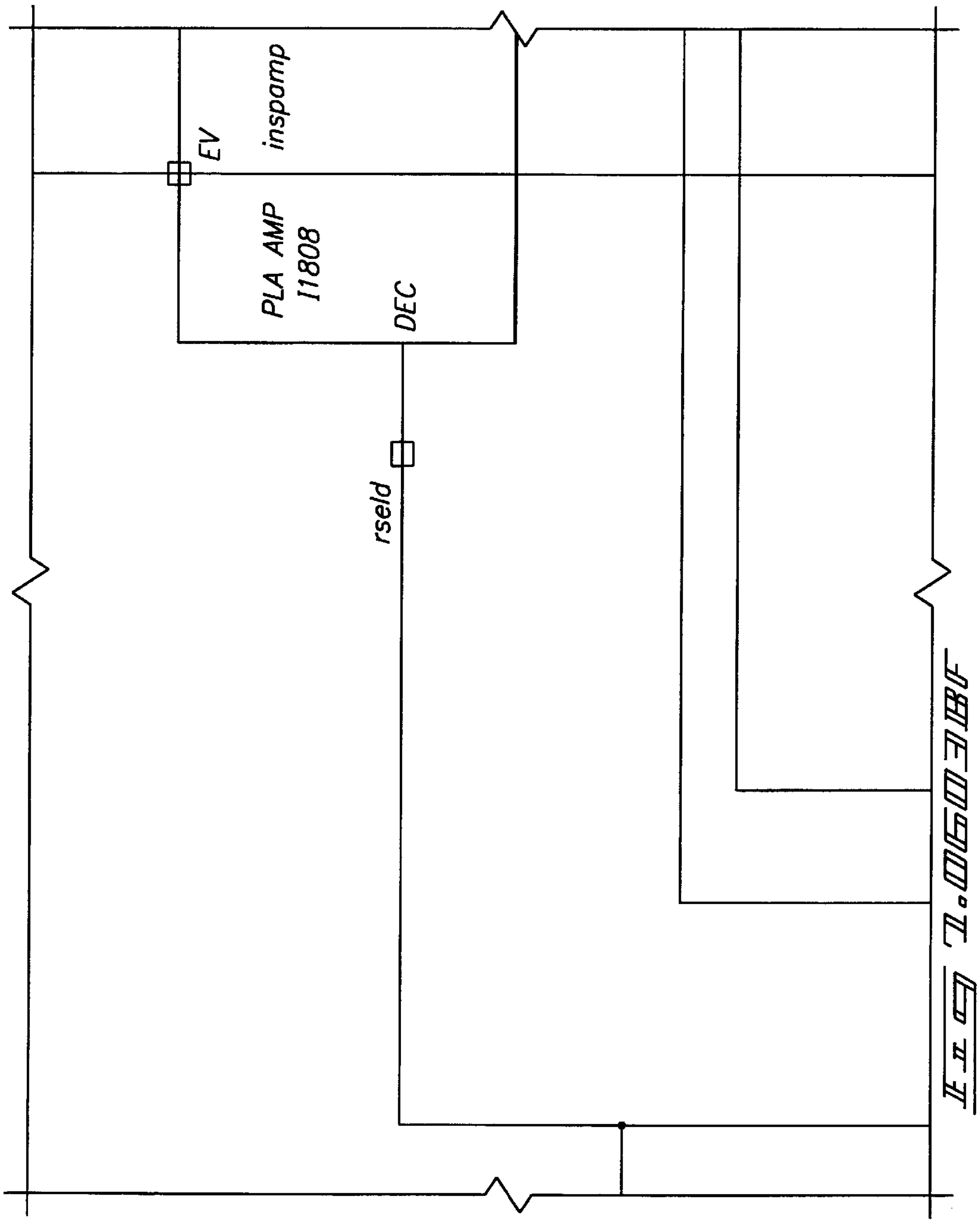
FIG. 7.0603BF

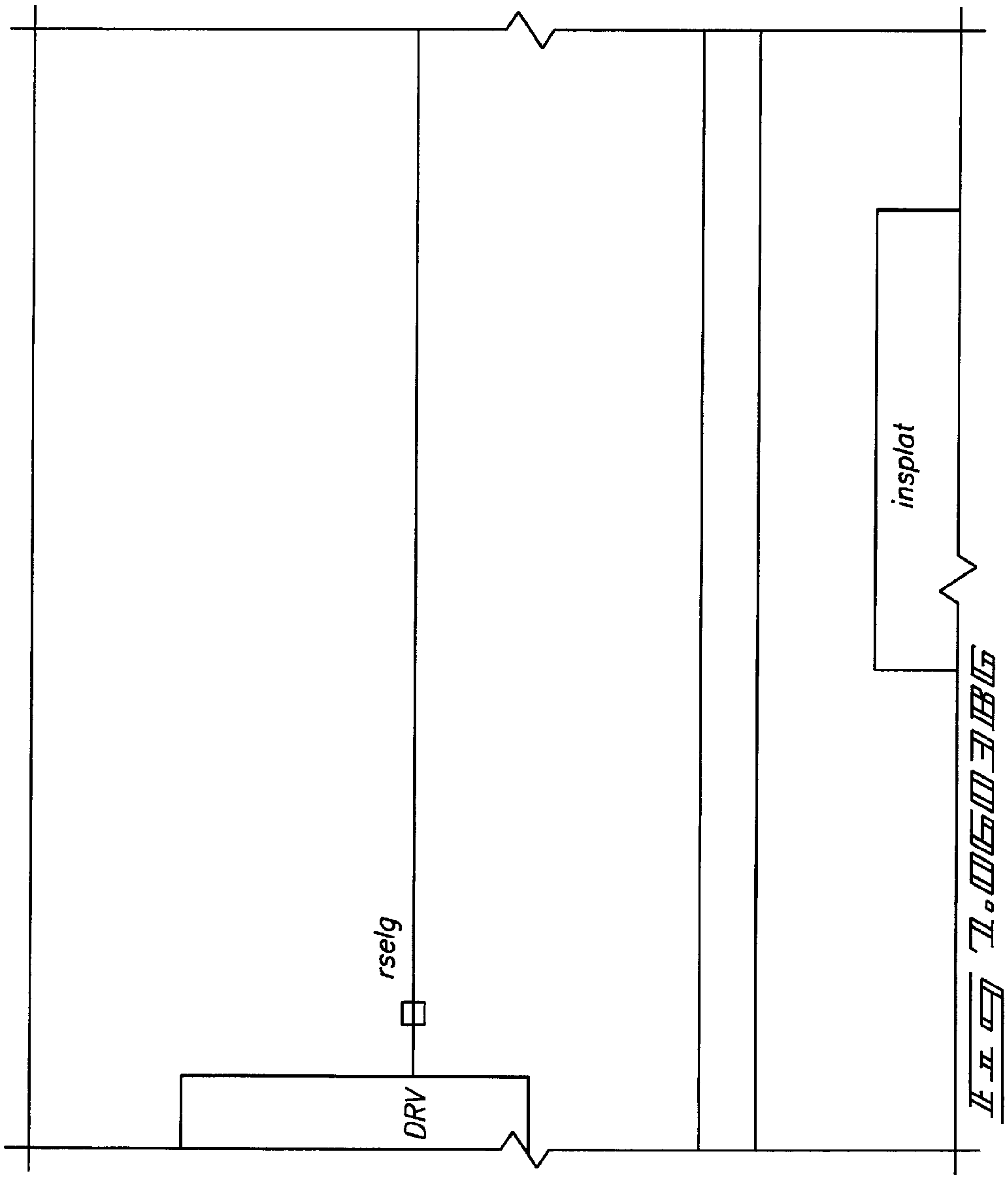
Fig. 7.06037BG

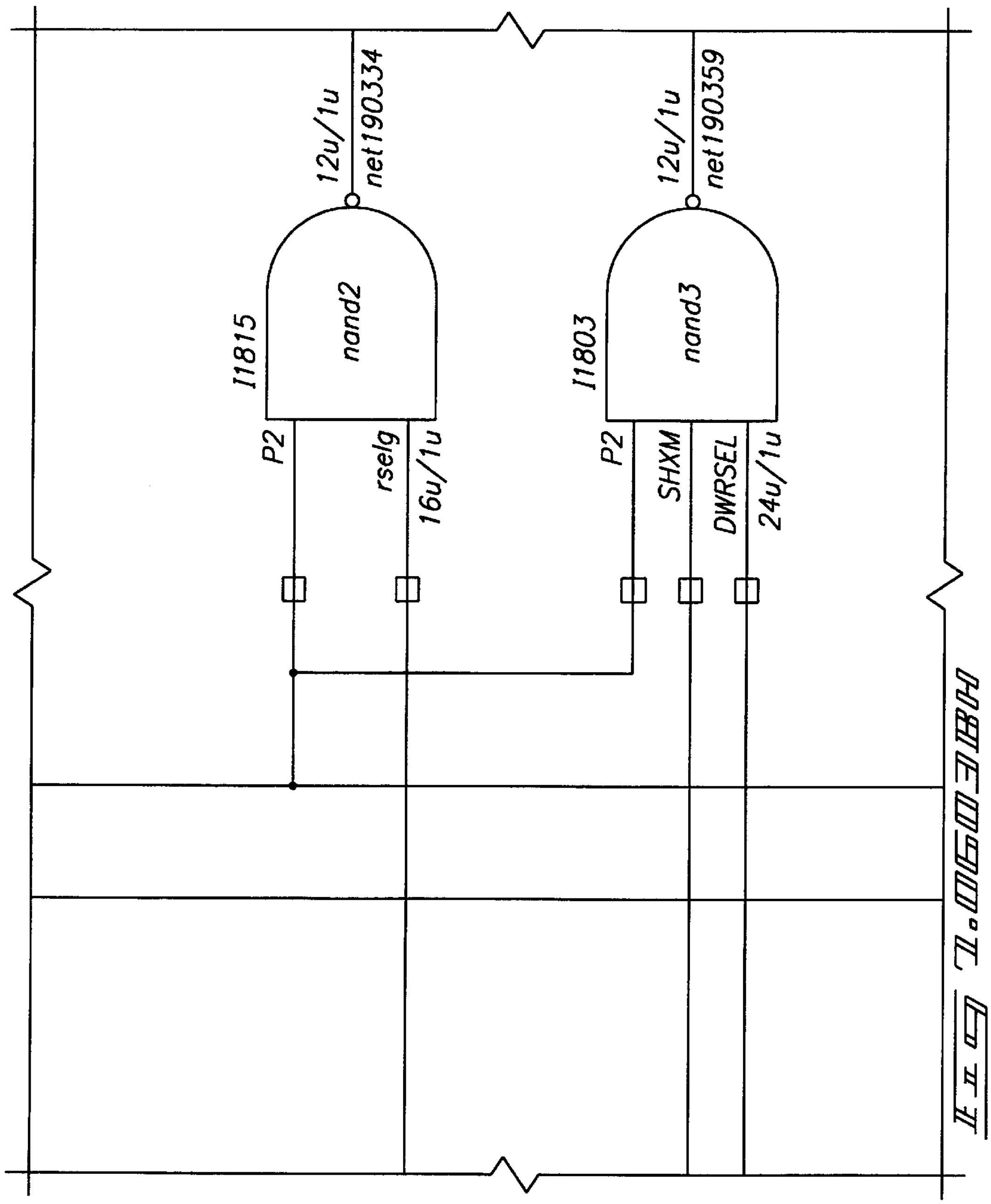
Fig. 7.0603BH

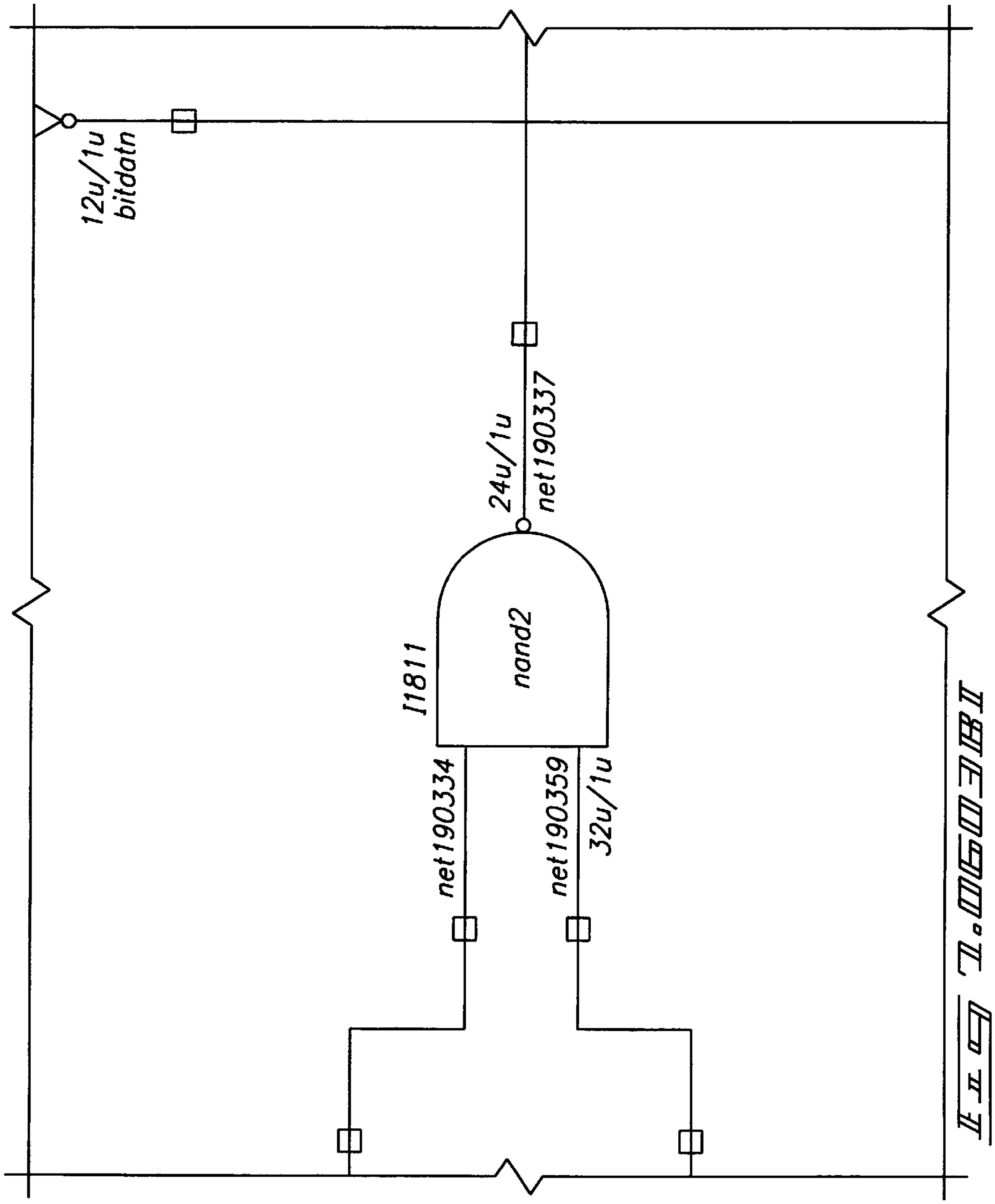
Fig. 7.06903BI

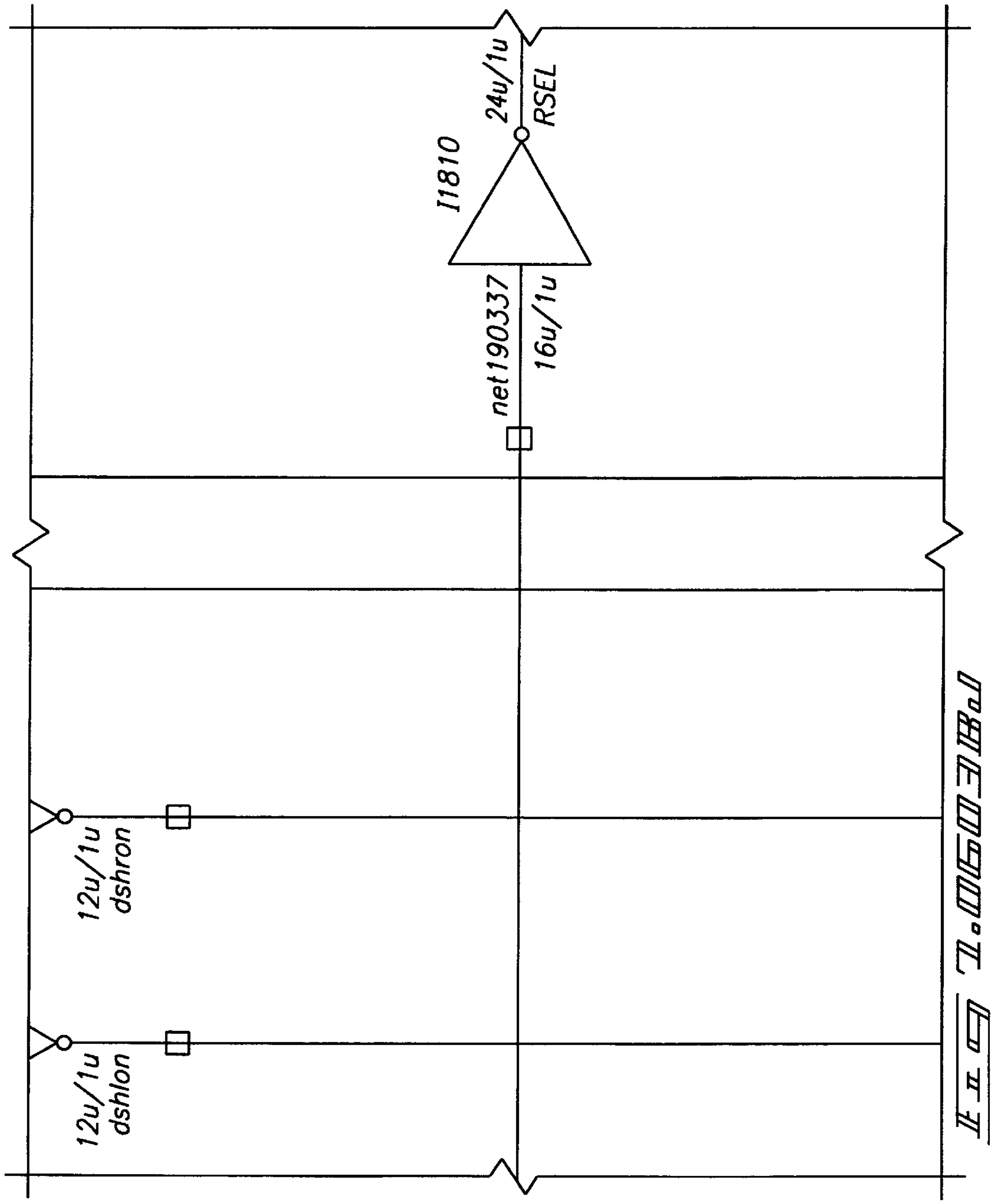
Fig. 7.0603BJ

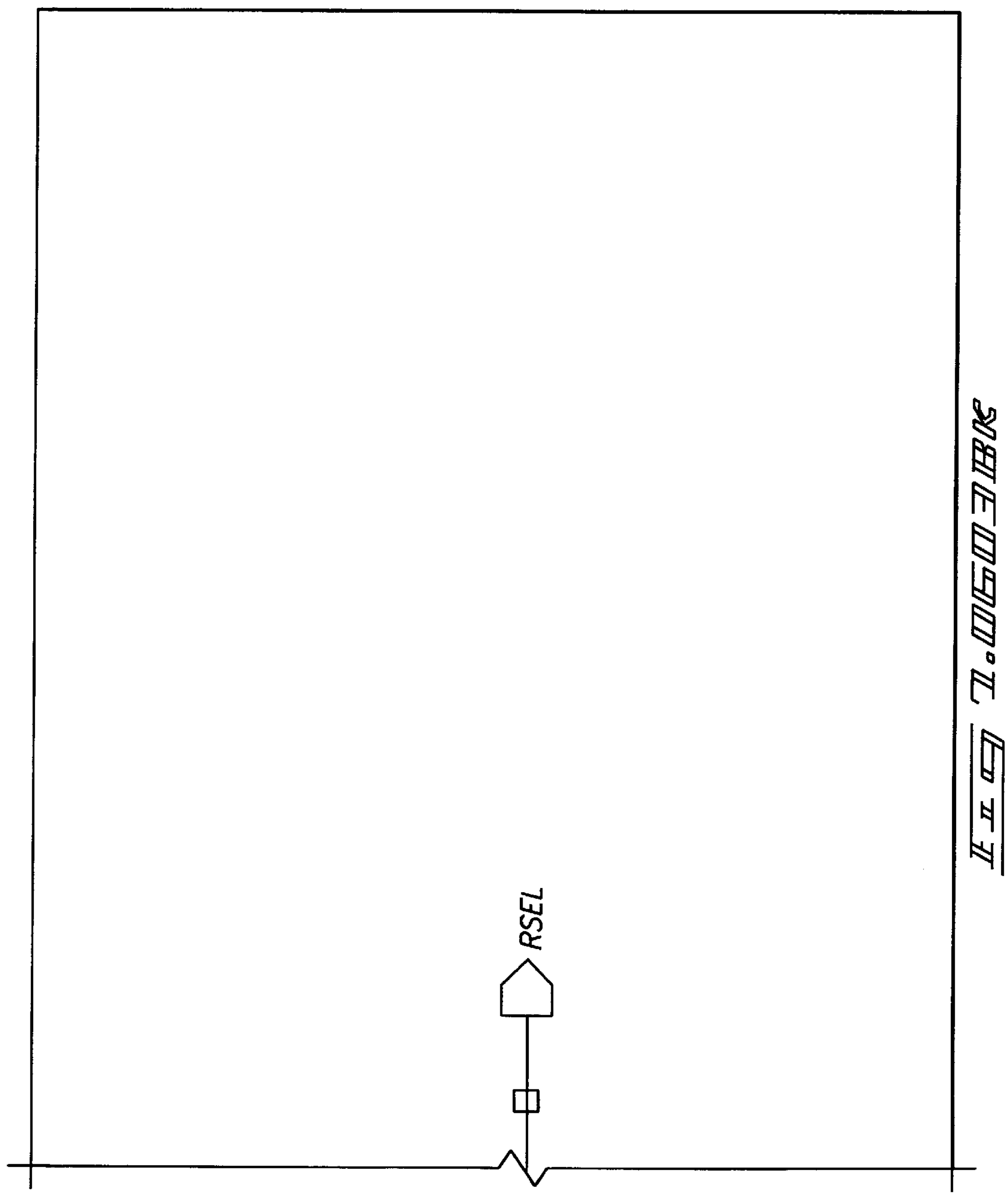
FIG. 7.060.3BK

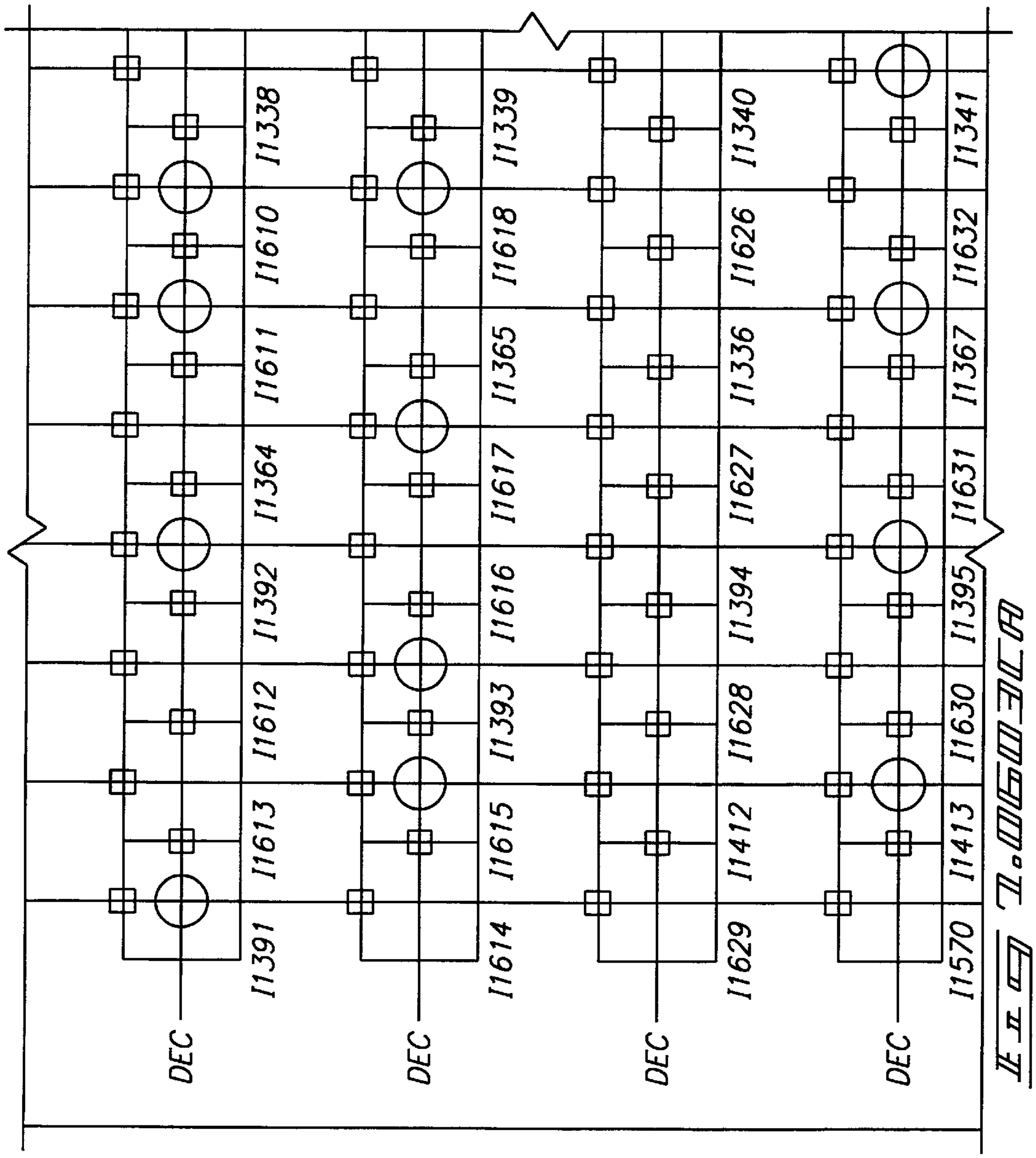
FIG. 7.06G3CA

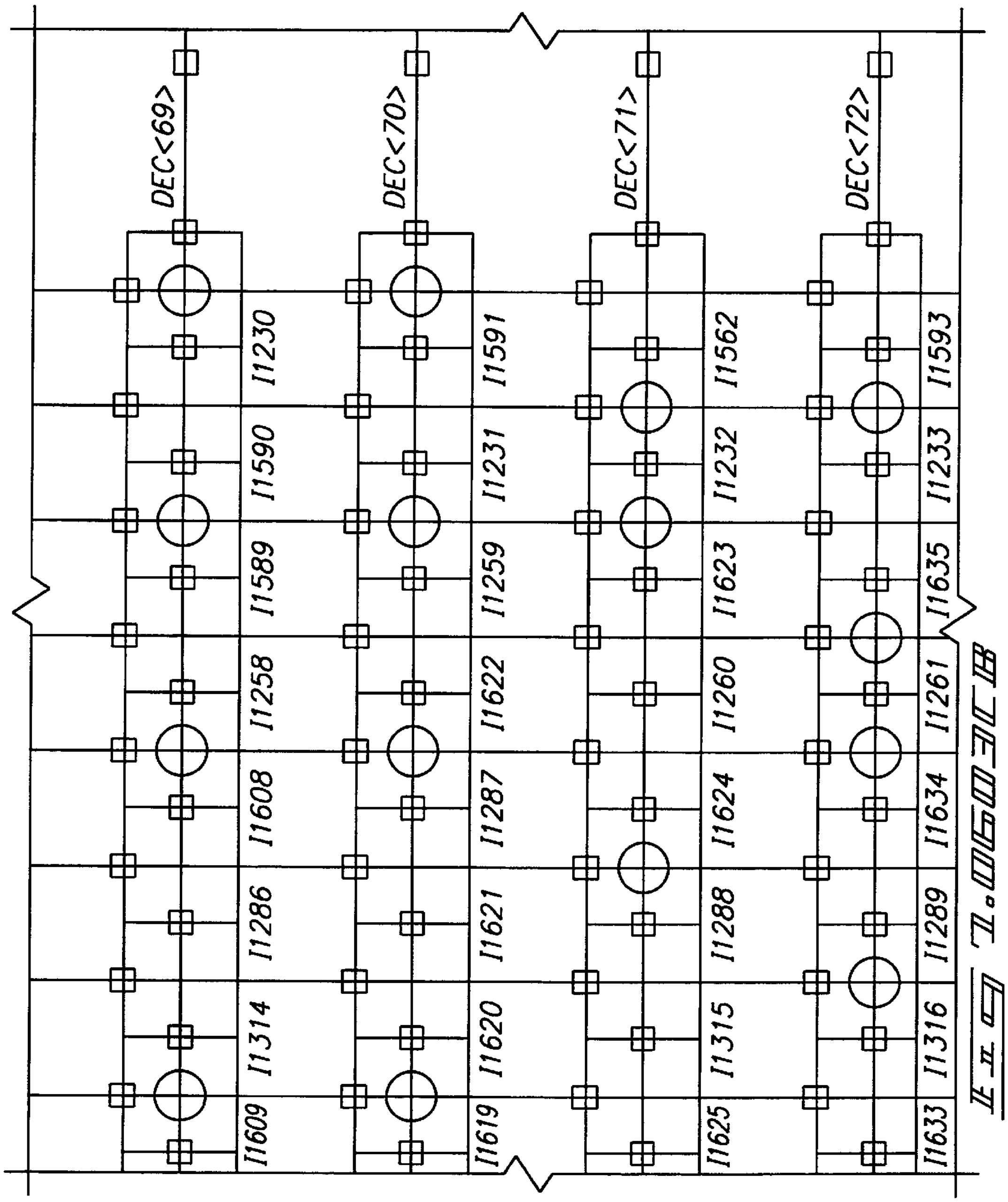
Fig. 7.0603CB

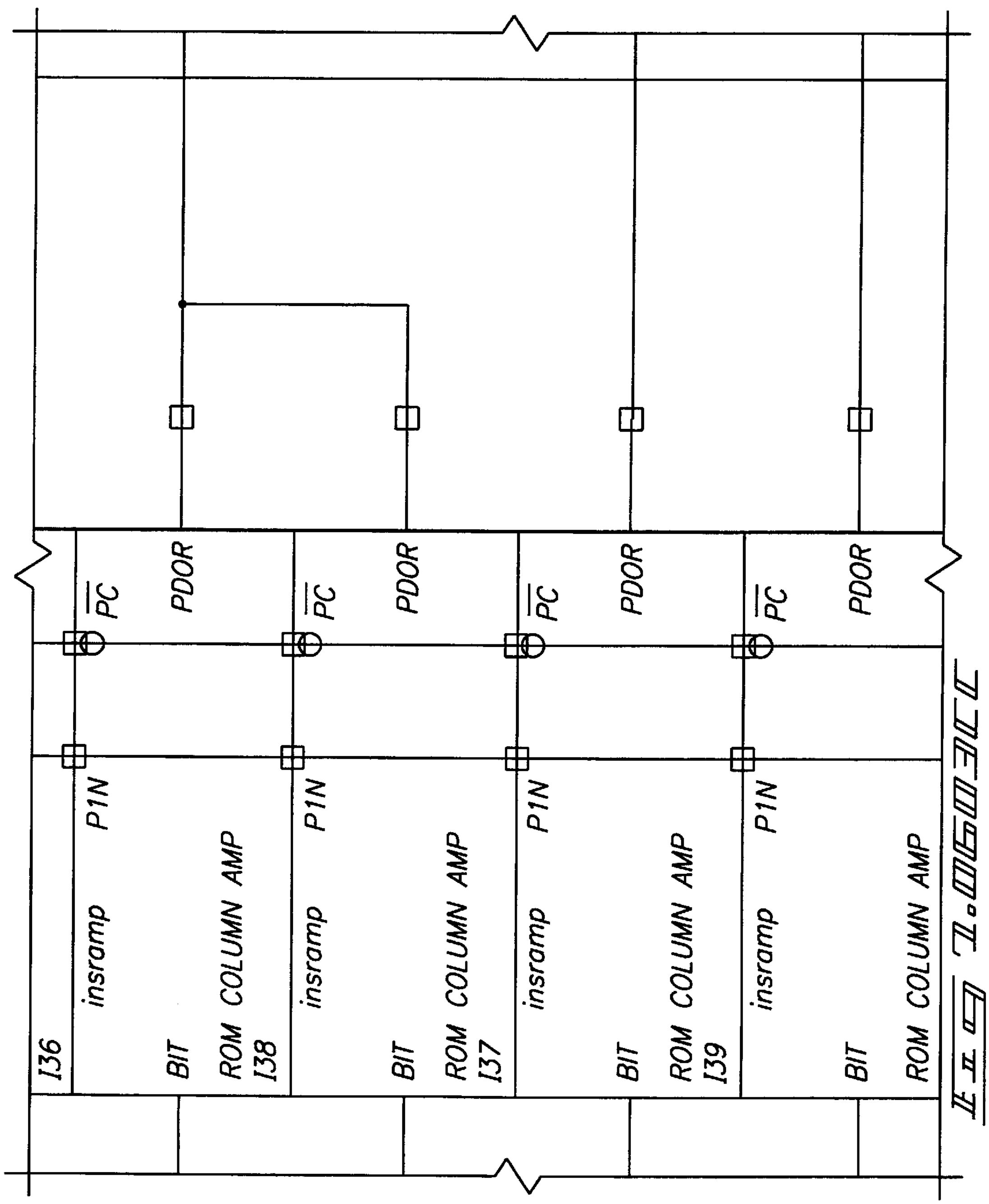
FIG. 1.0603CC

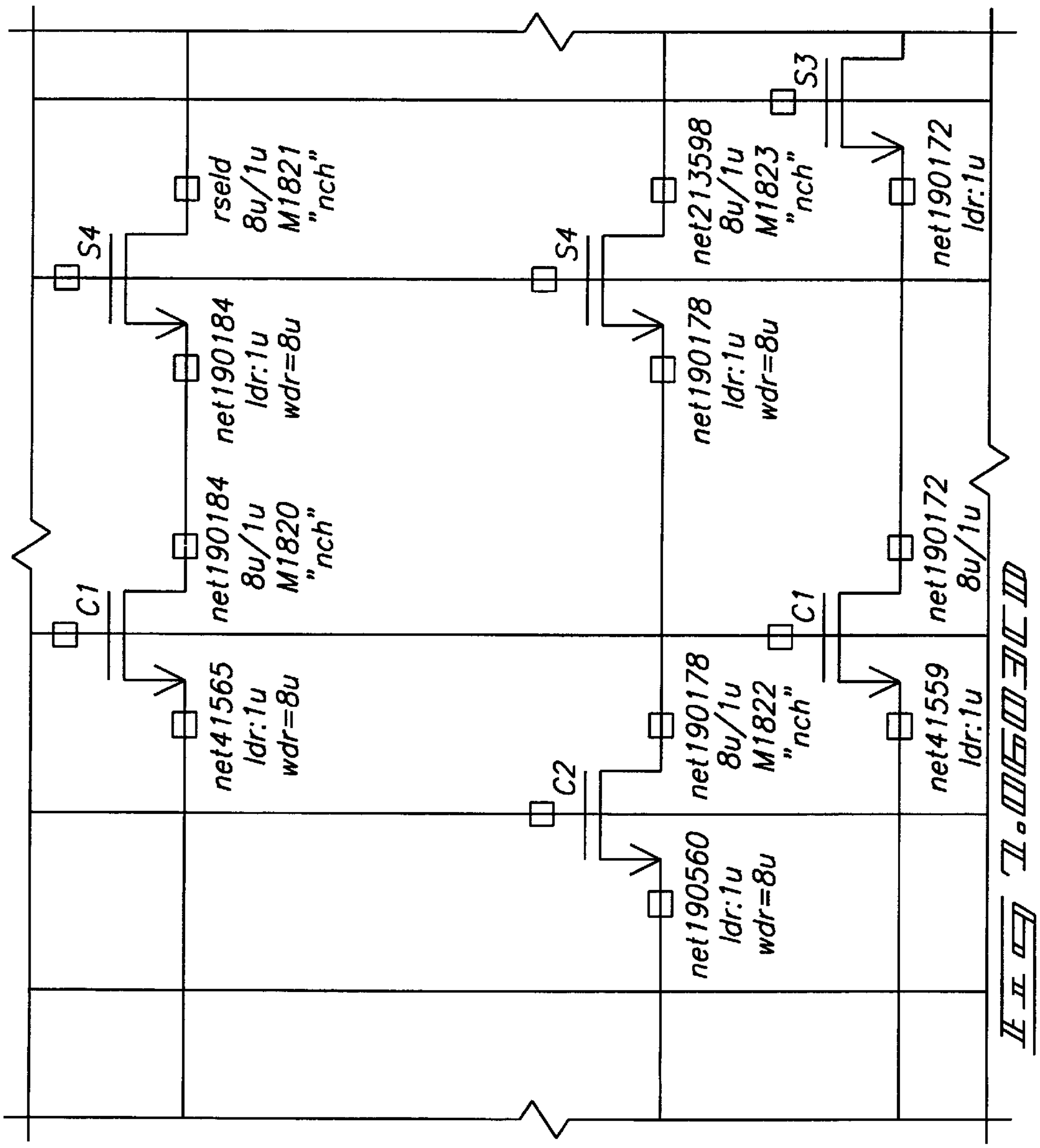
S4
rseld
8u/1u
M1821
"nch"
net190184
ldr:1u
wdr=8u
S4
net213598
8u/1u
M1823
"nch"
net190178
ldr:1u
wdr=8u
S3
net190172
ldr:1u
C1
net190184
8u/1u
M1820
"nch"
net41565
ldr:1u
wdr=8u
C2
net190178
8u/1u
M1822
"nch"
net190560
ldr:1u
wdr=8u
C1
net190172
8u/1u
net41559
ldr:1u

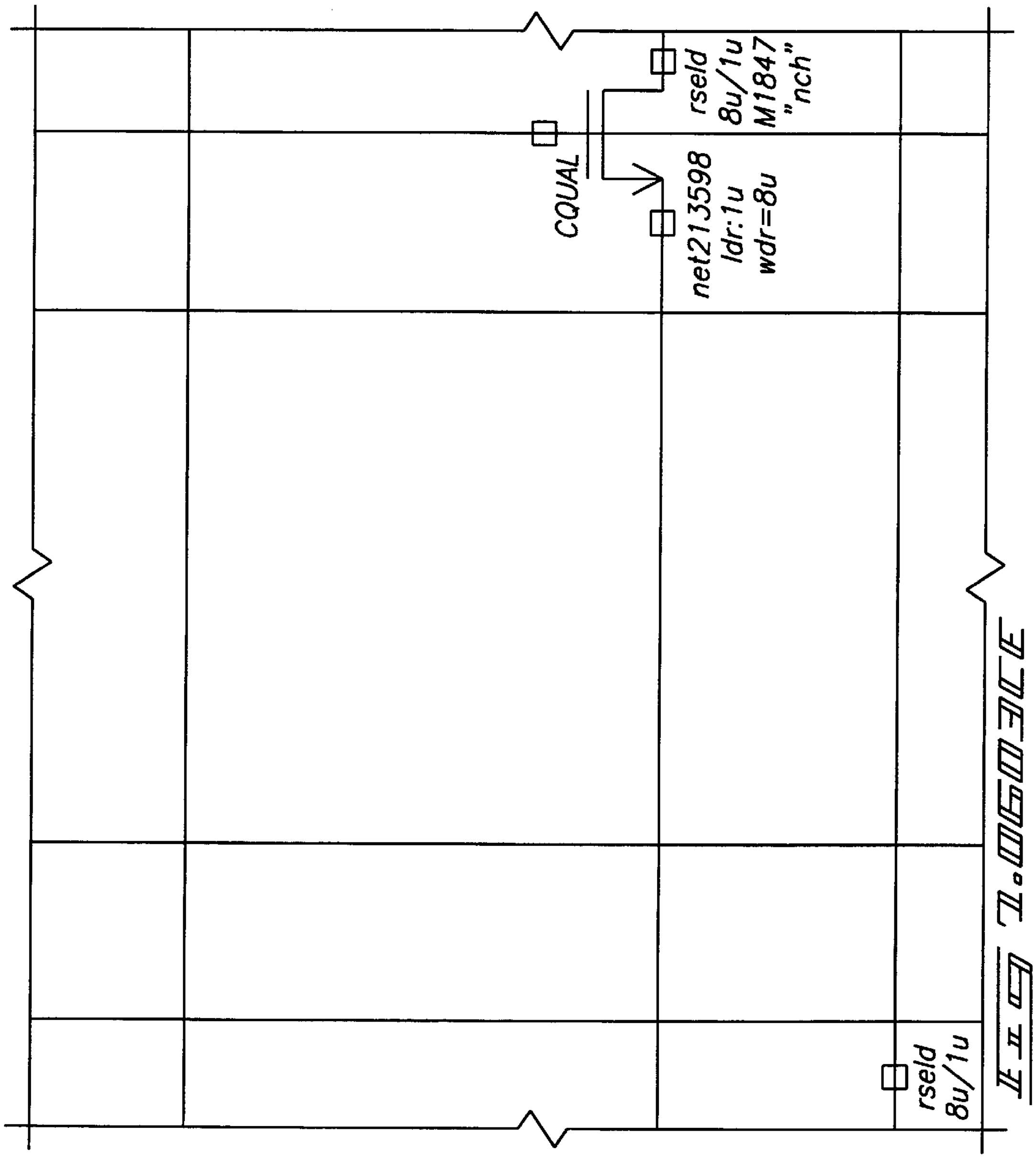
FIG. 7.060ACE

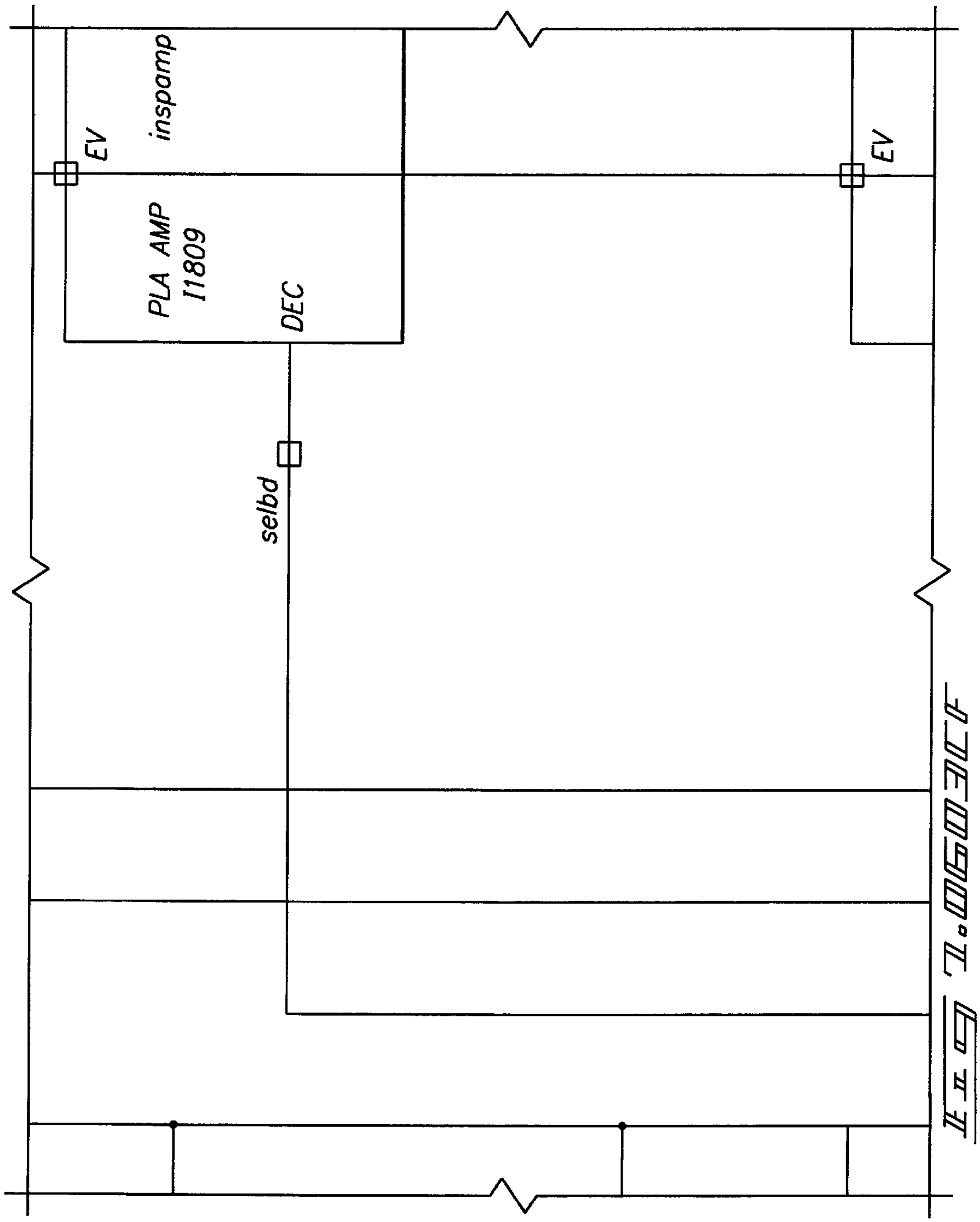
Fig. 7.0603CF

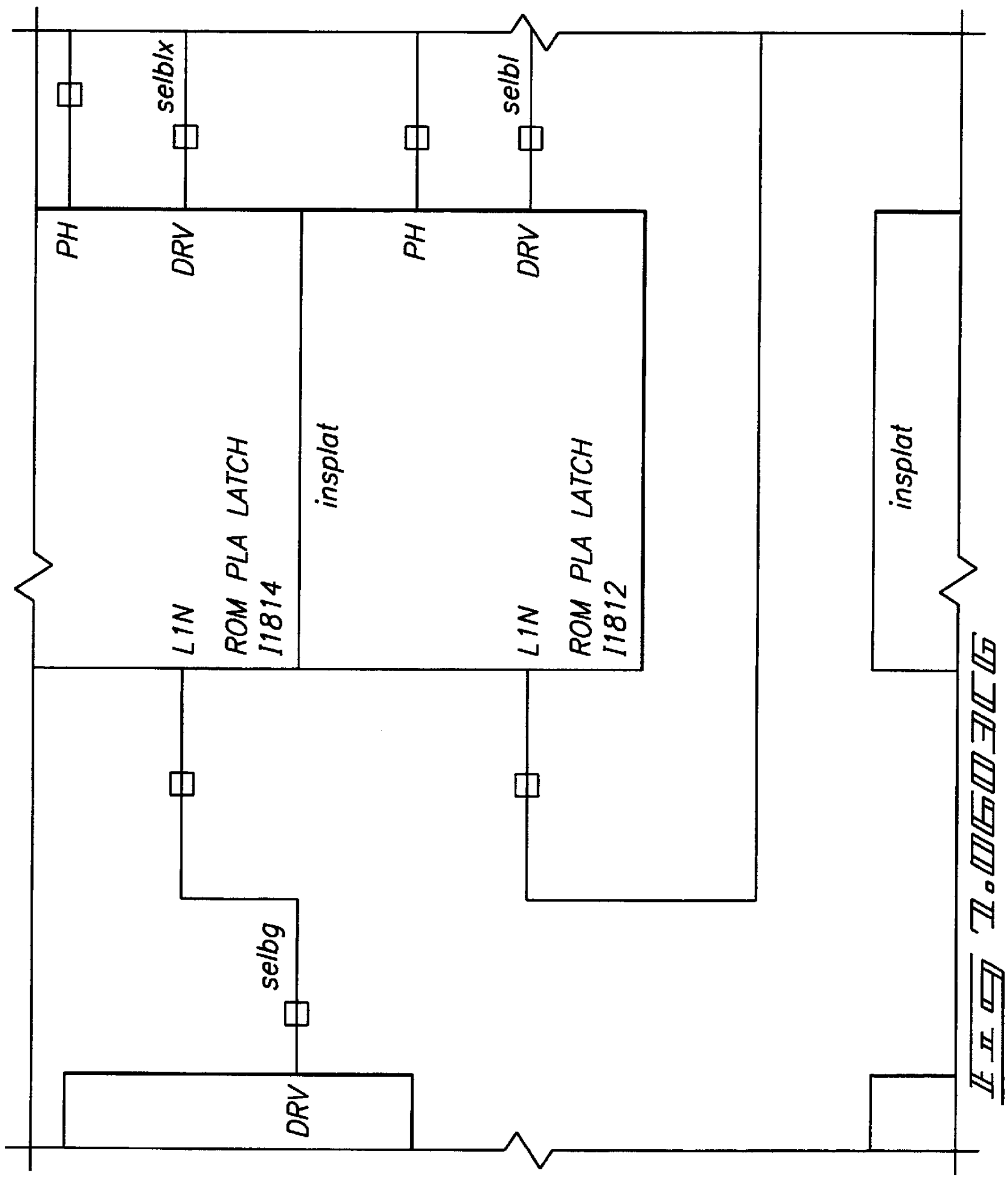
Fig. 7.0607C6

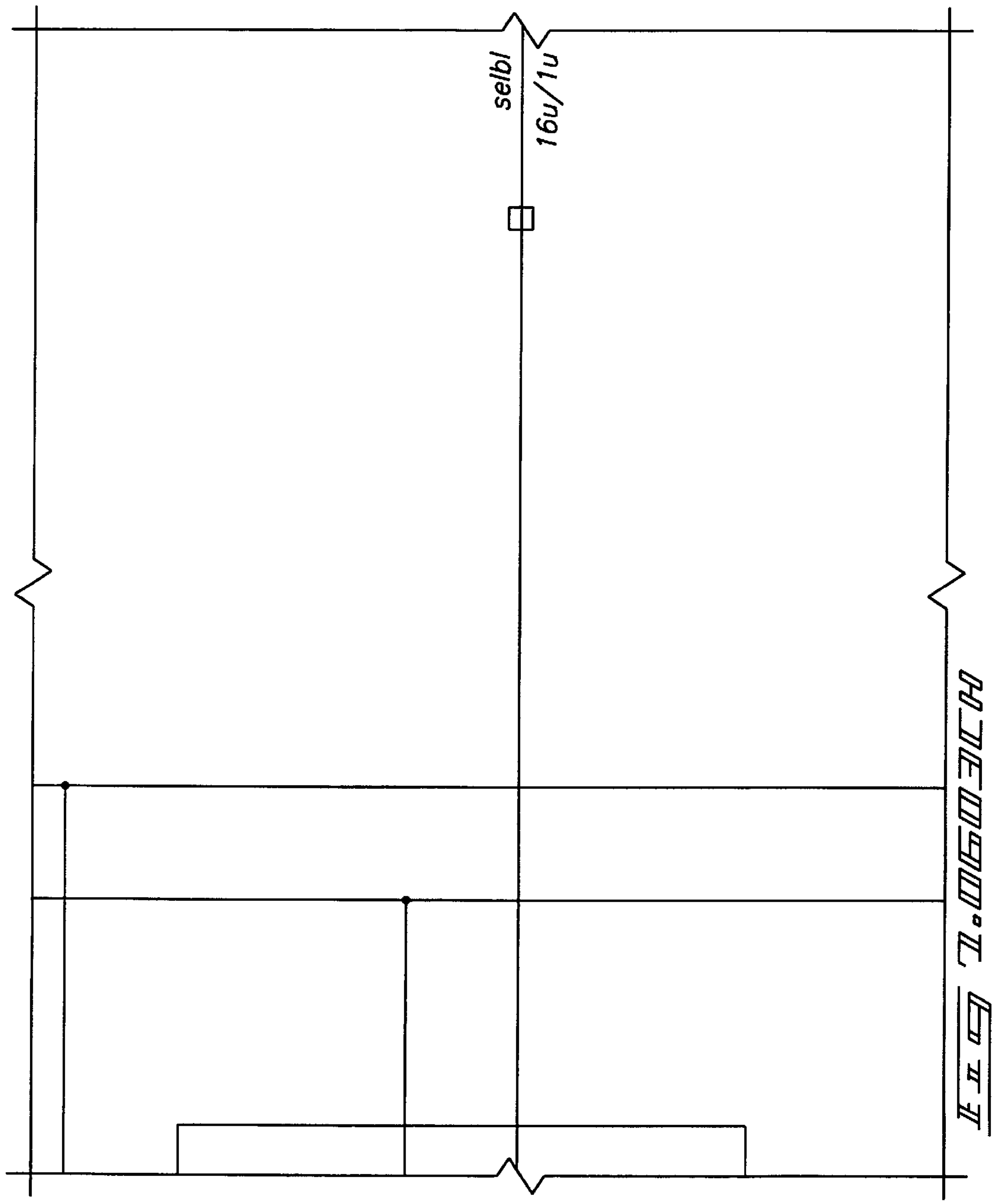
FIG. 7.090EJH

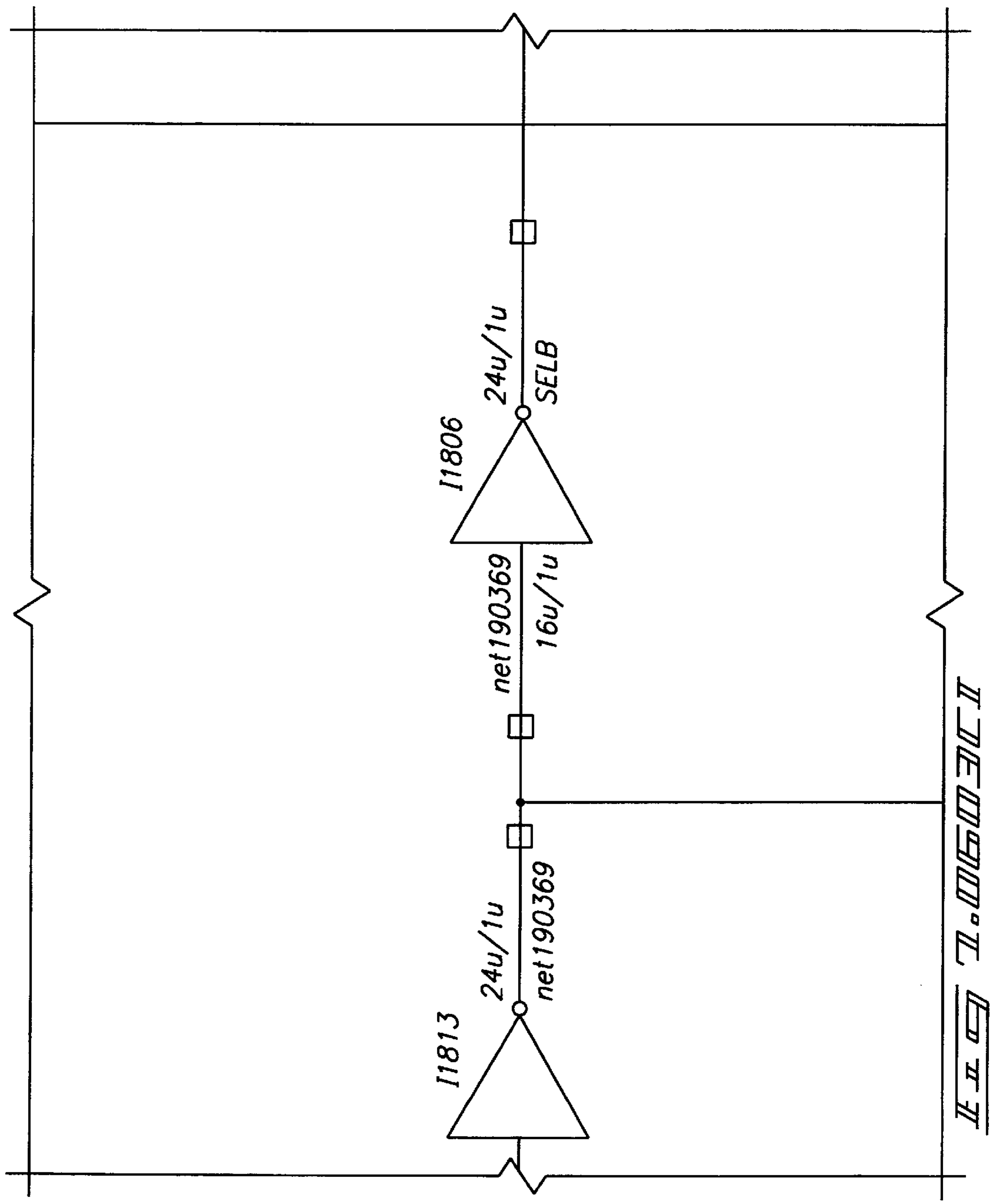
FIG. 7.0690.3II

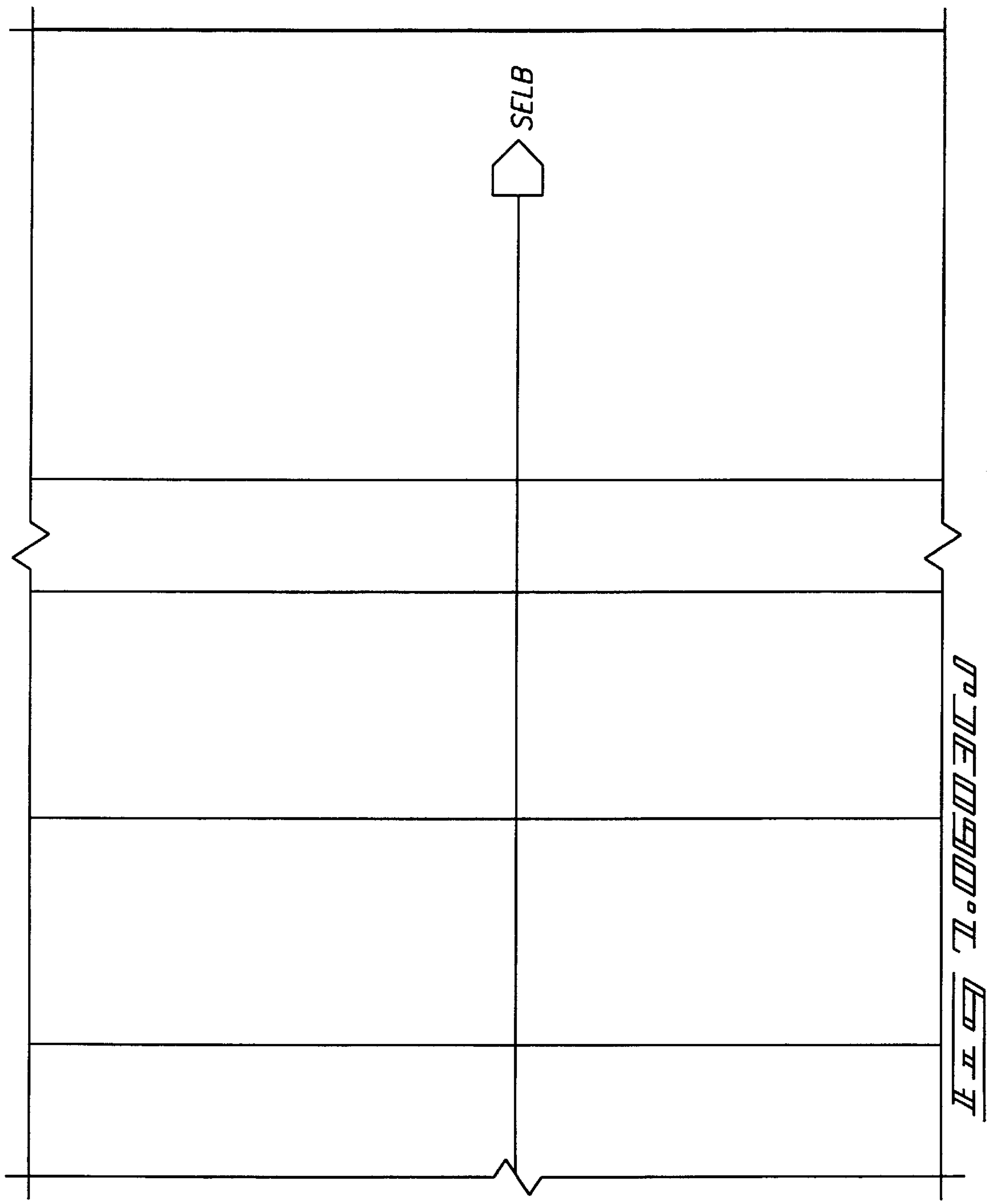
FIG. 7.0603CJ

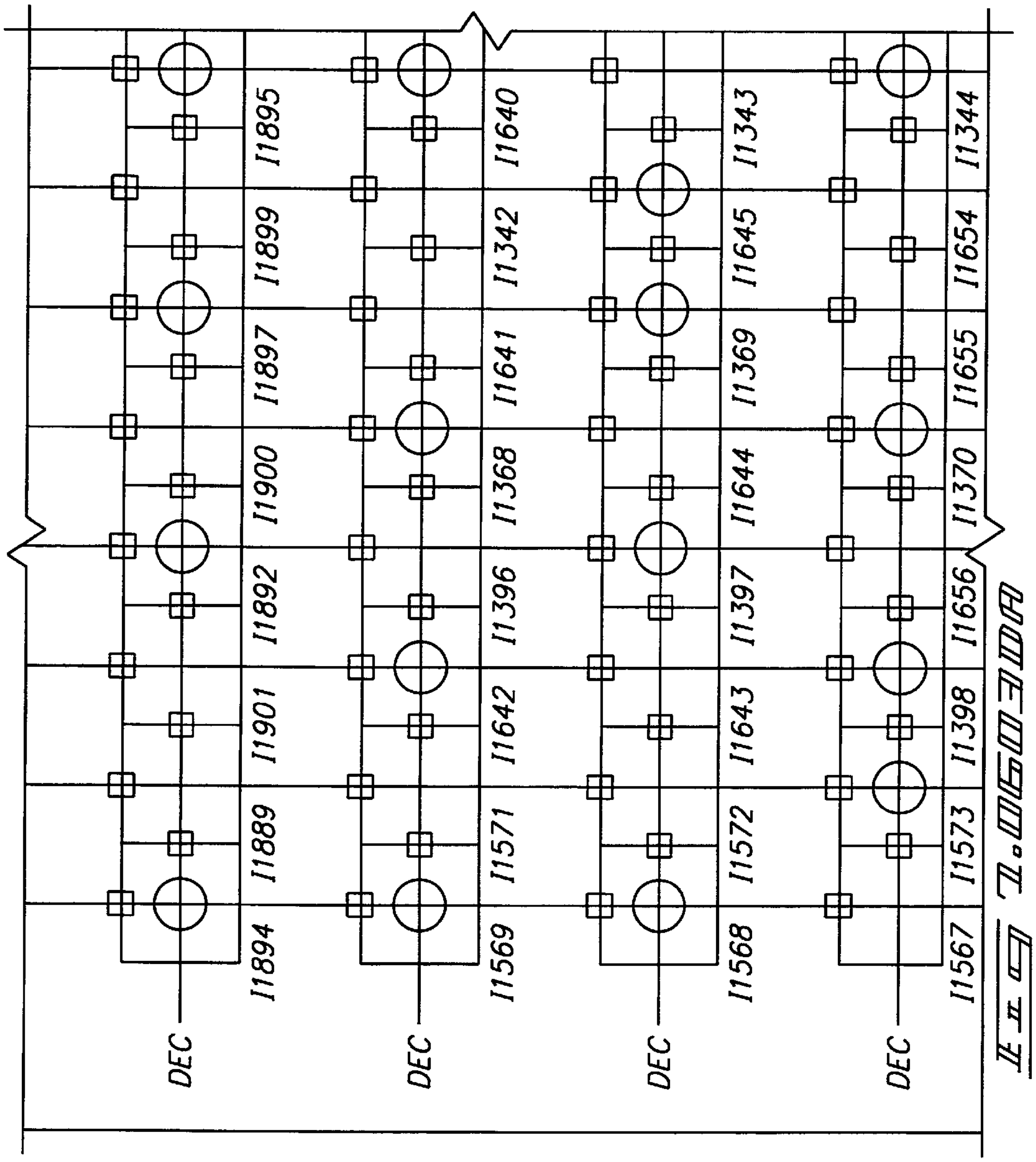
FIG. 1.0603DA

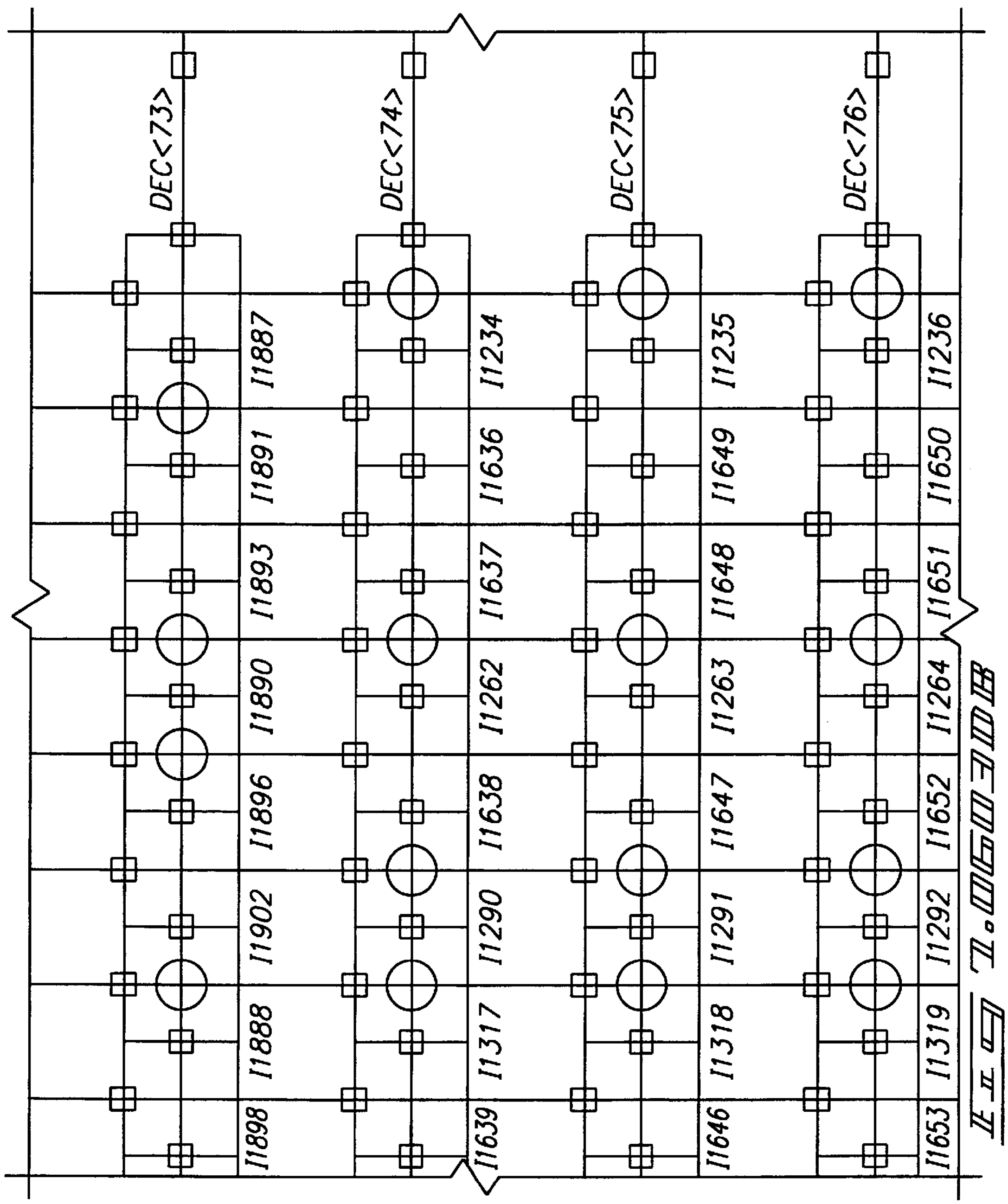
FIG. 7.0603DB

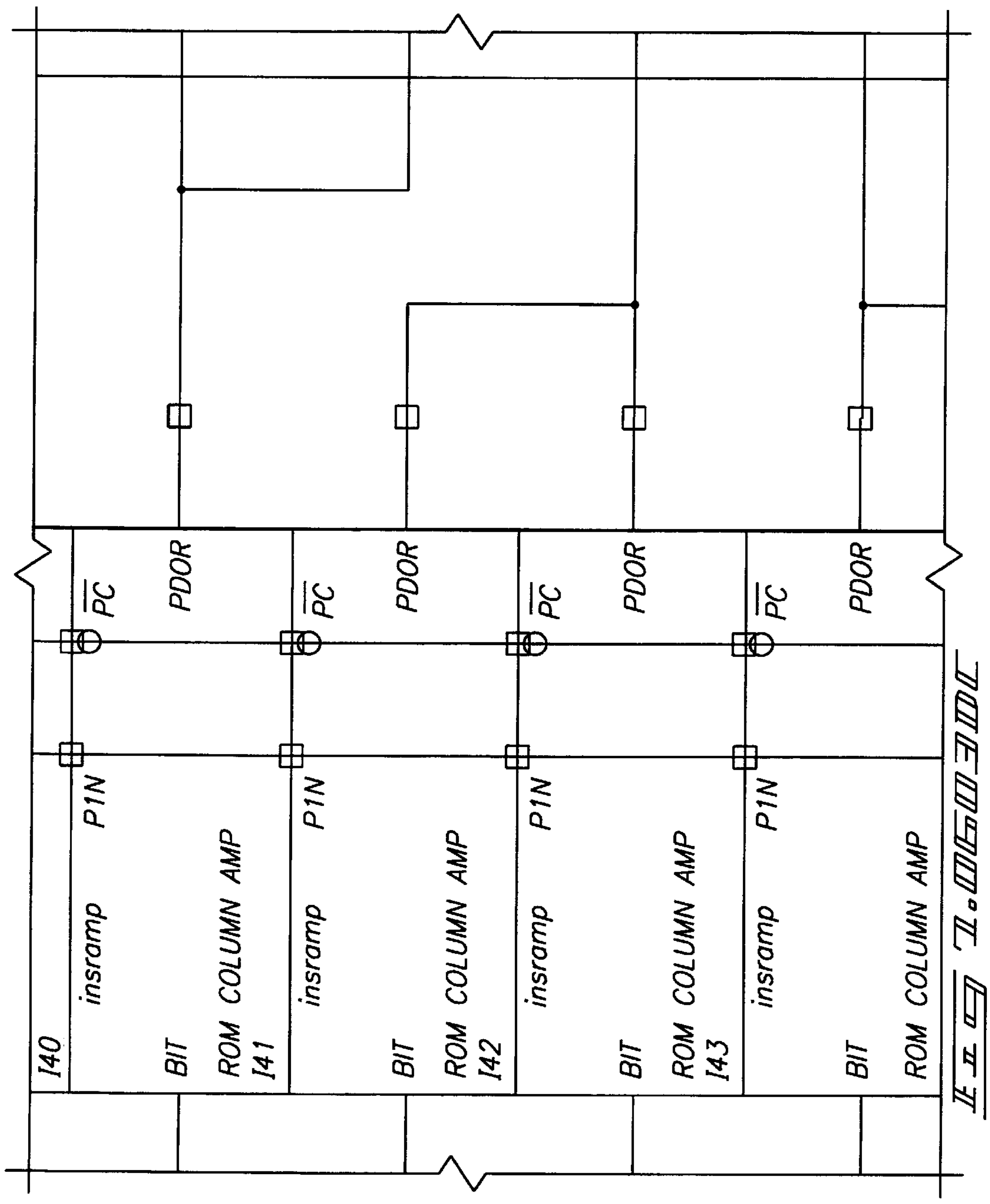
Fig. 1.0603DC

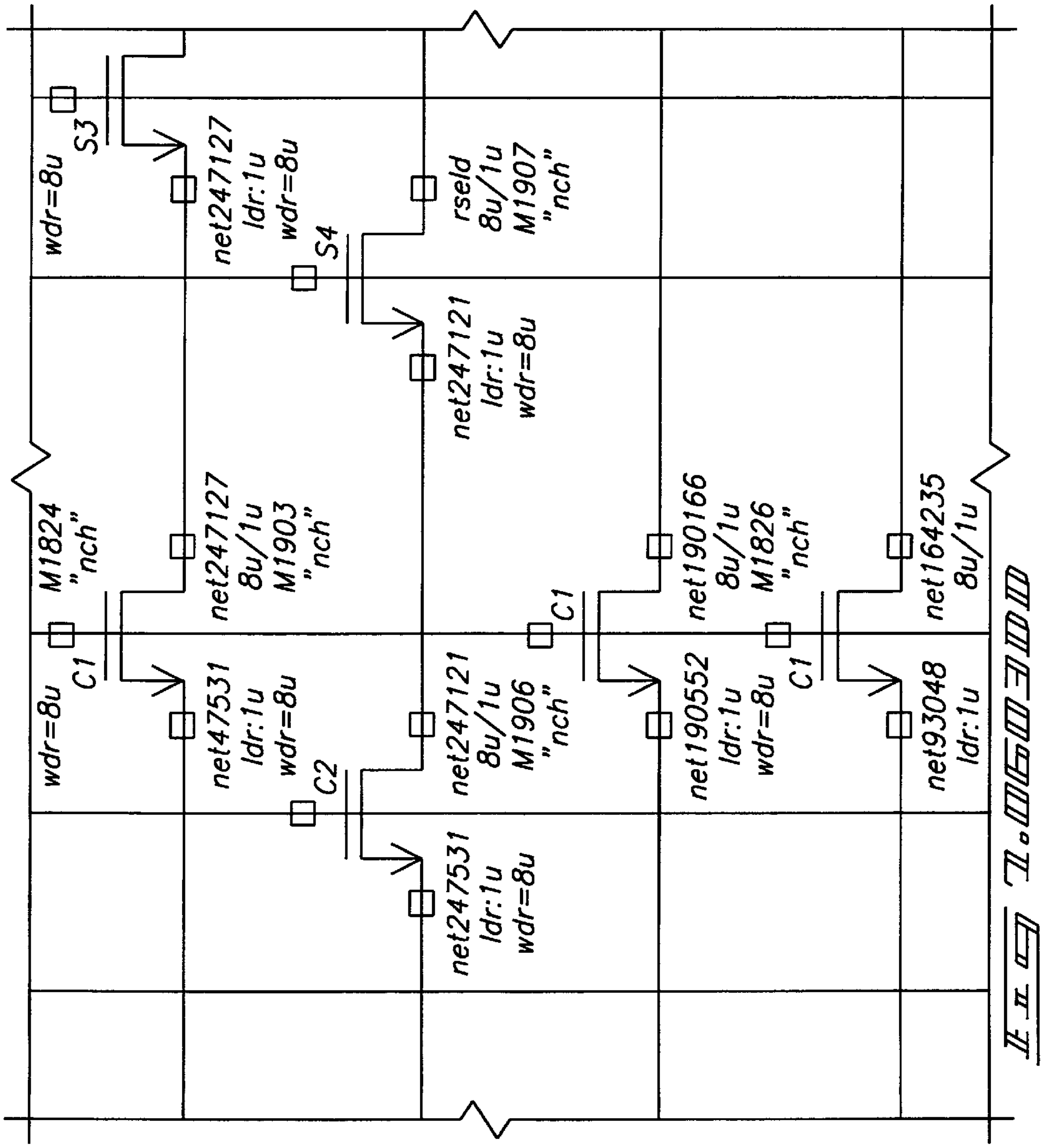
FIG. 7.06030D

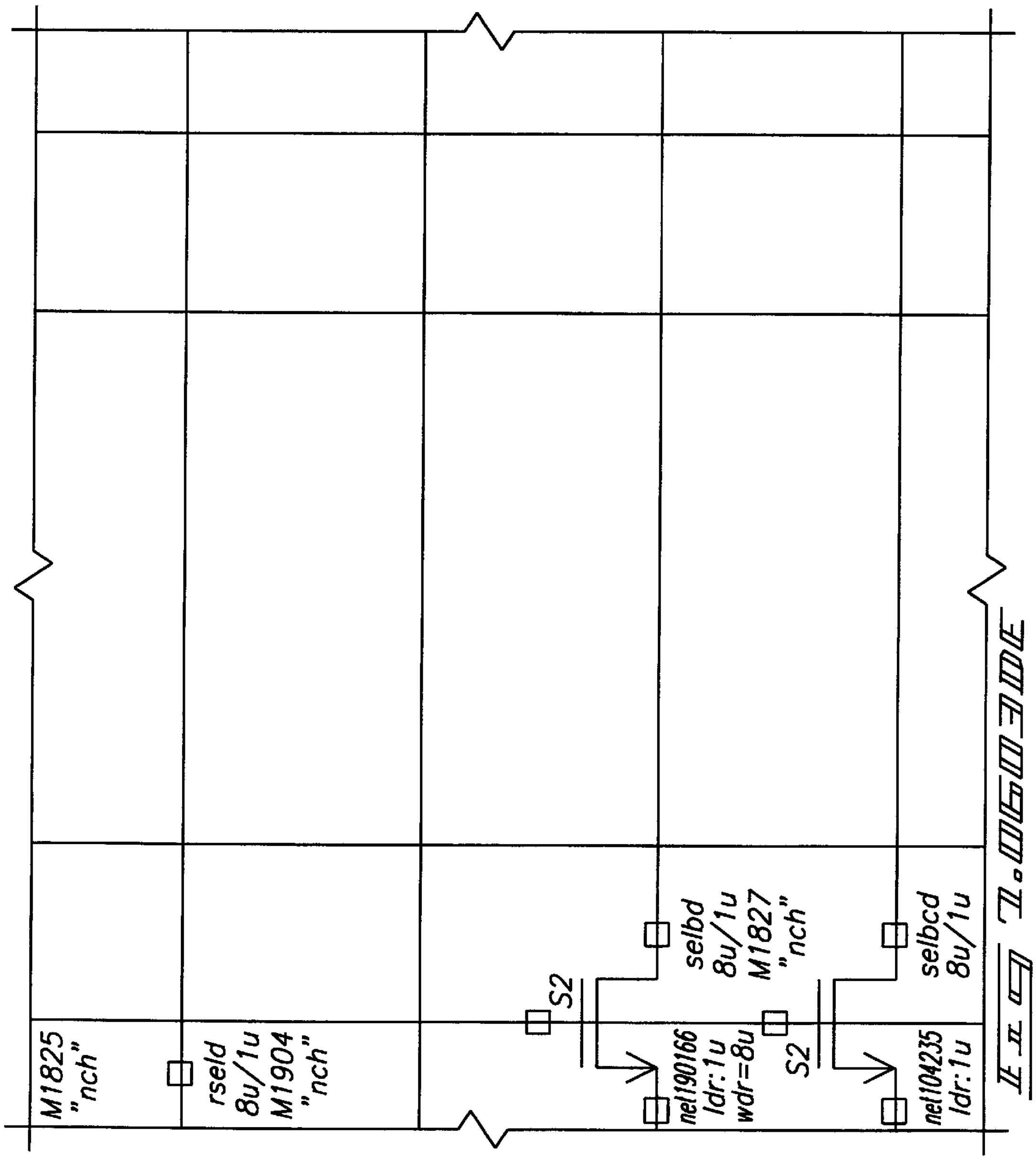
FIG. 7.0603DE

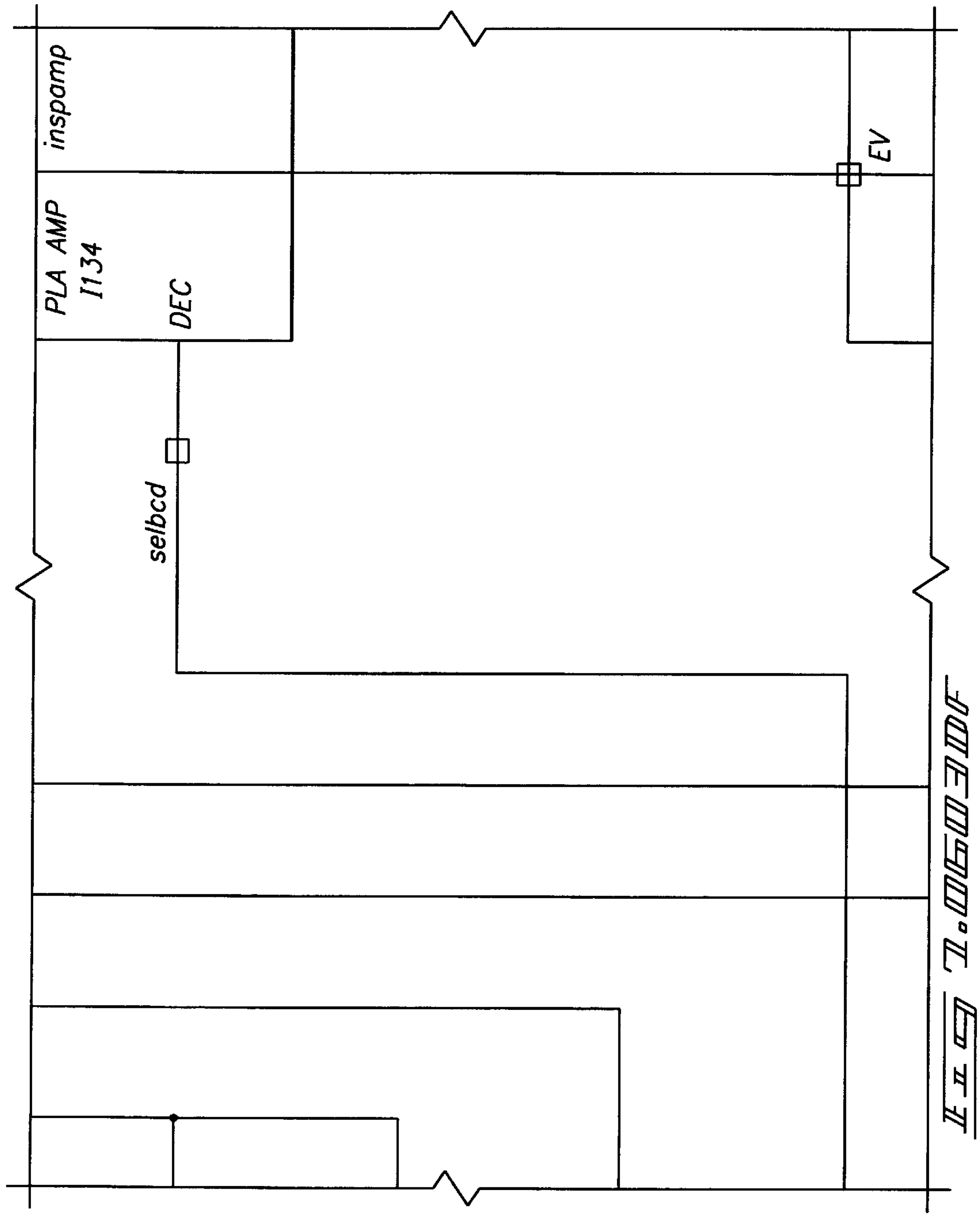
Fig. 7.0603DF

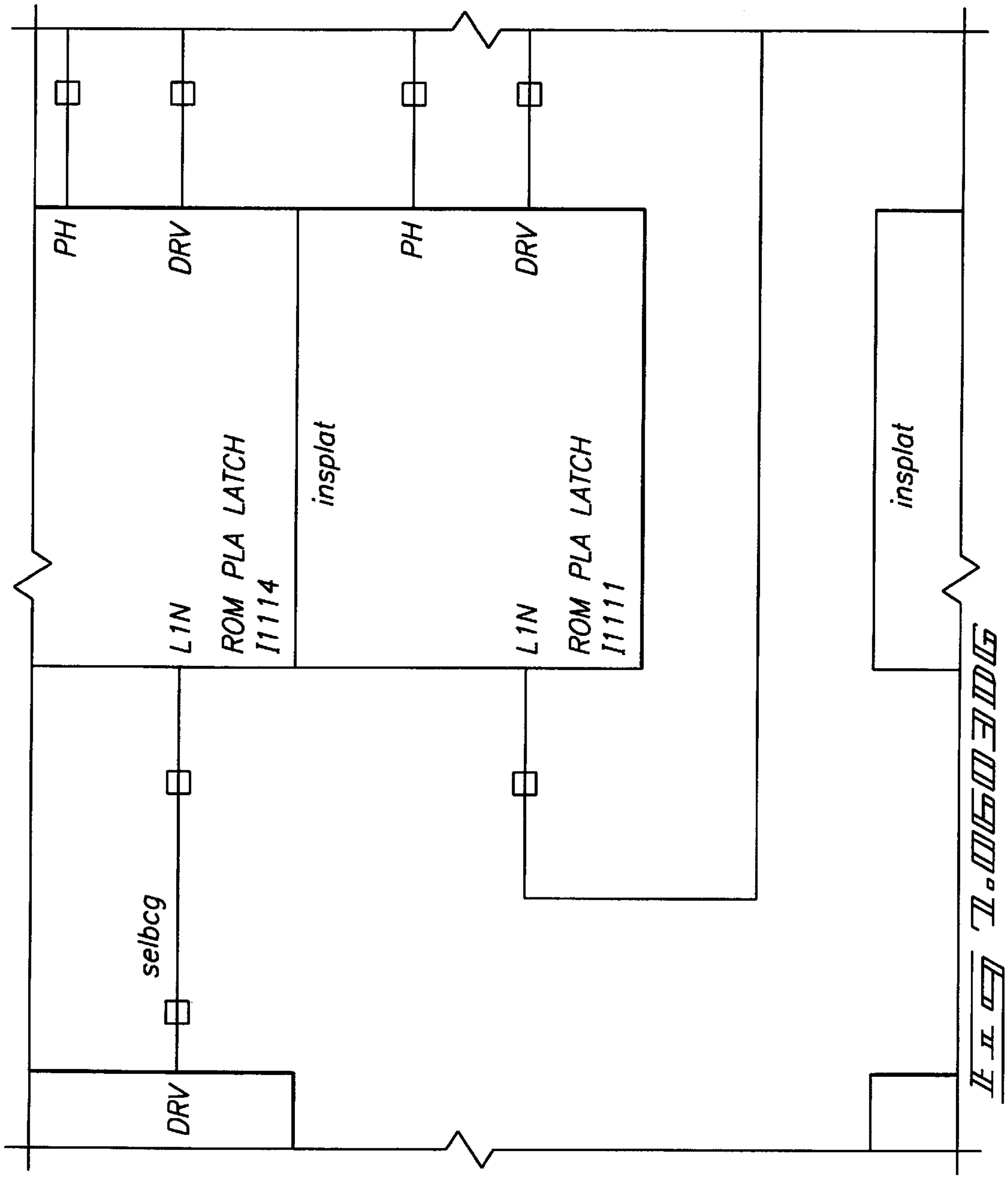
Fig. 7.069030G

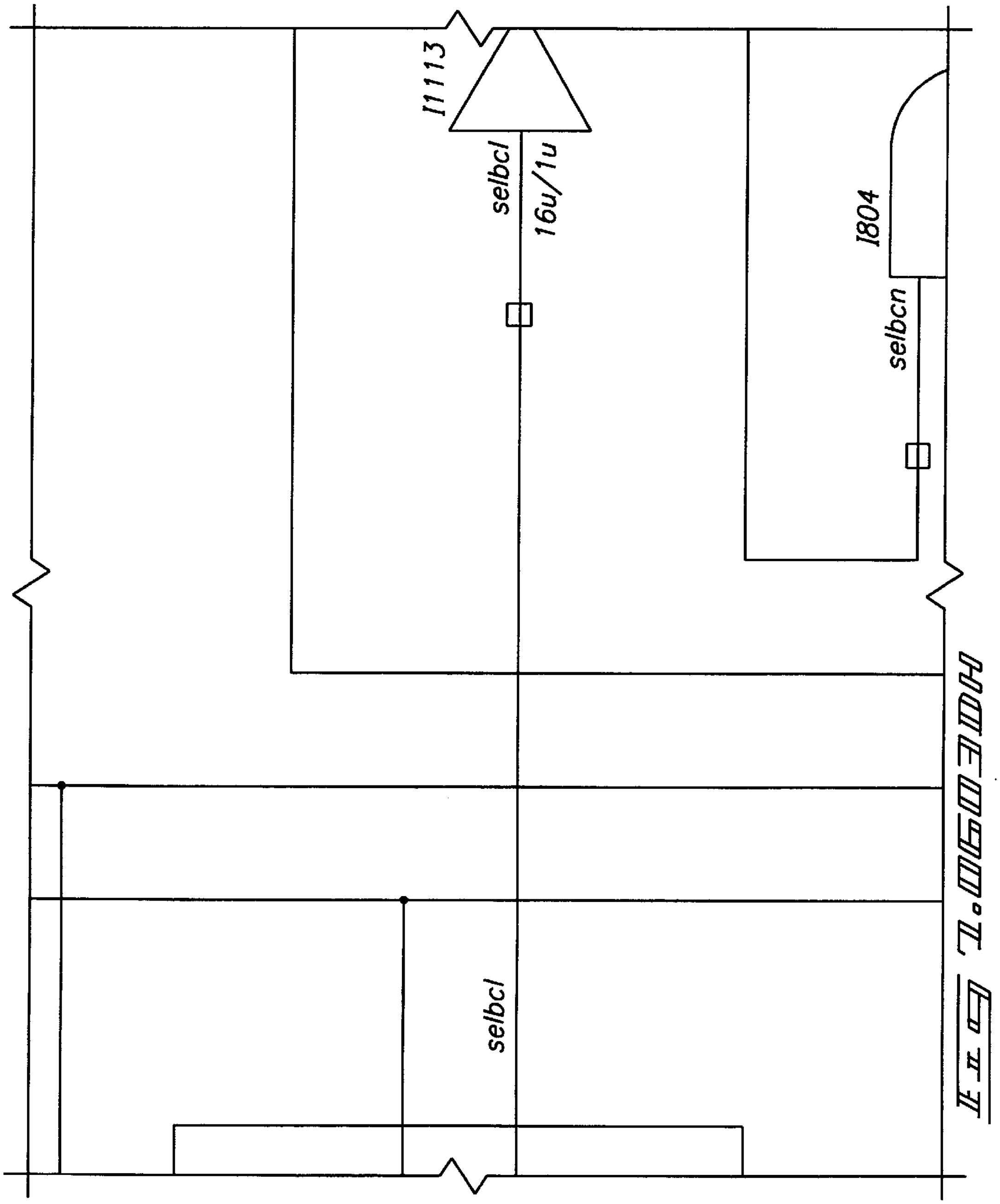
FIG. 7.0603DH

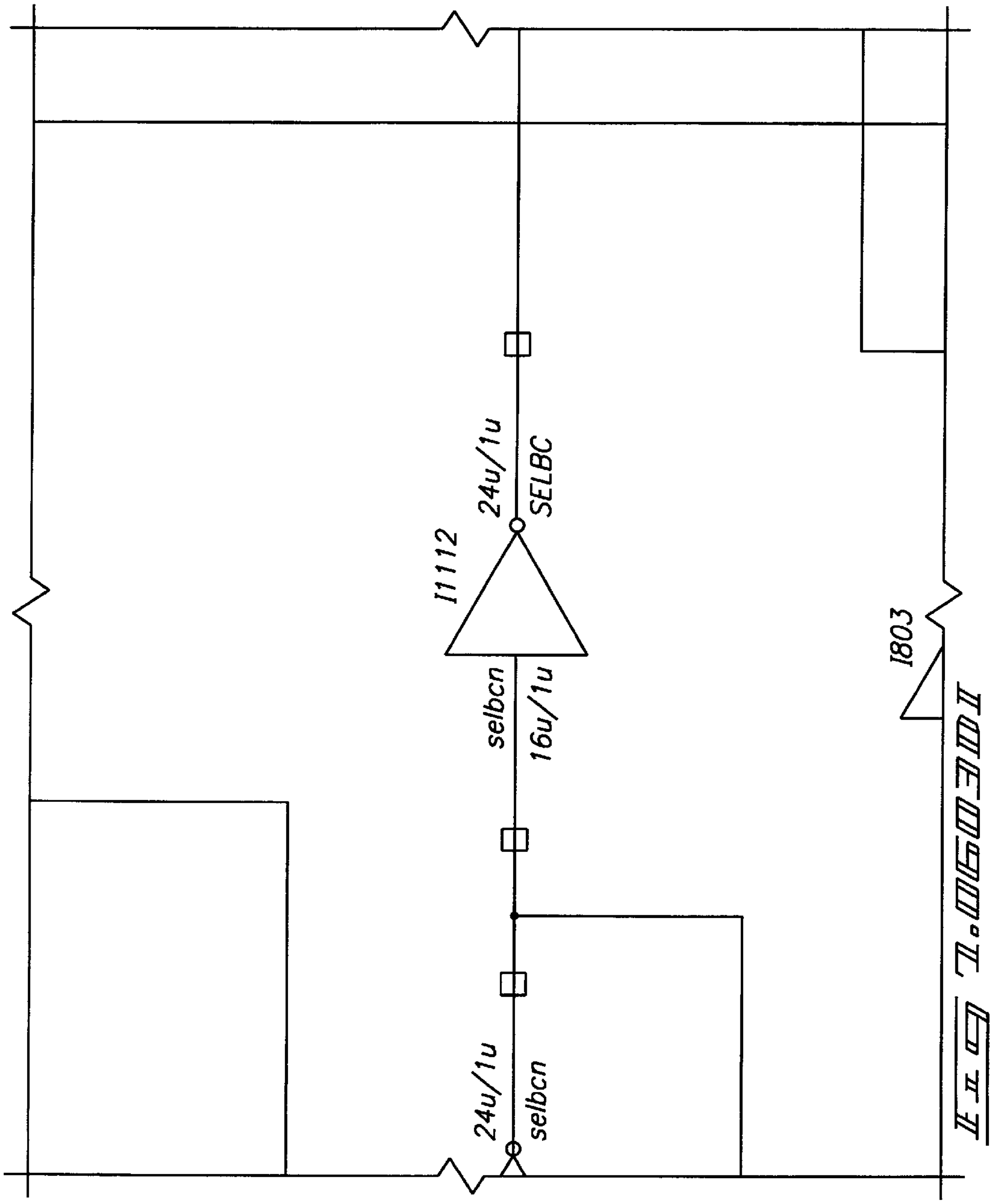
FIG. 7.0603DI

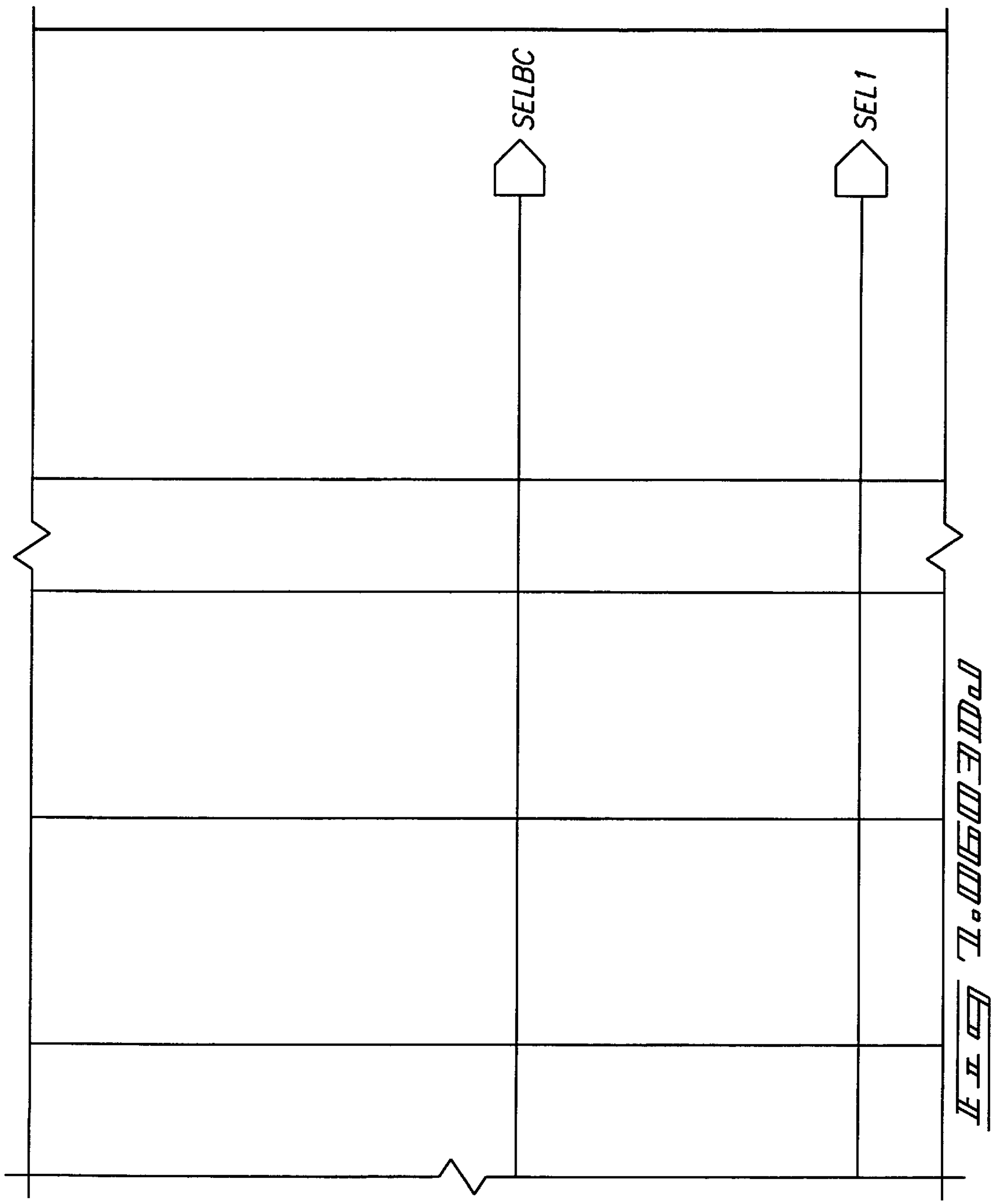
FIG. 7.0603DJ

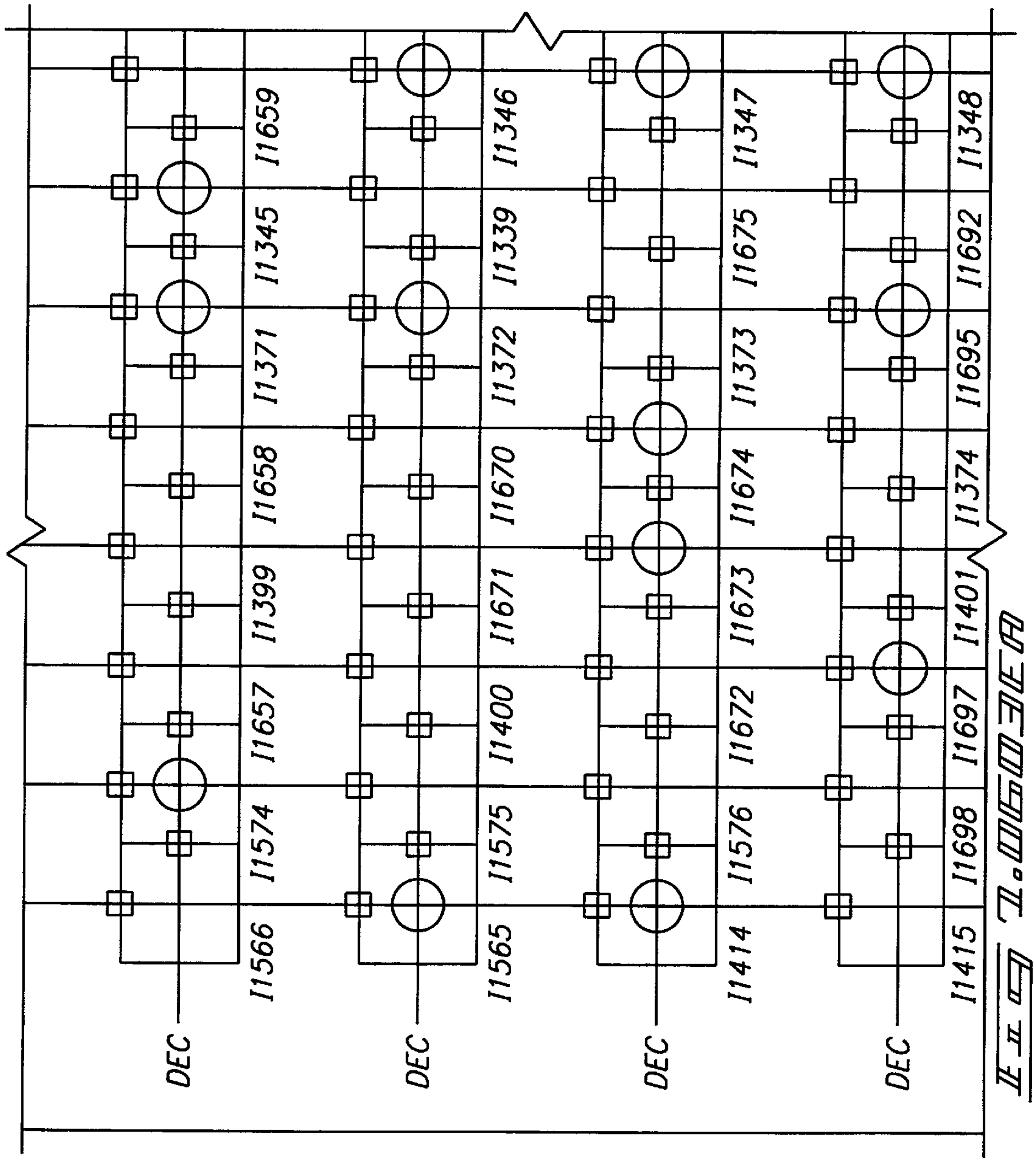
FIG. 7.0603EA

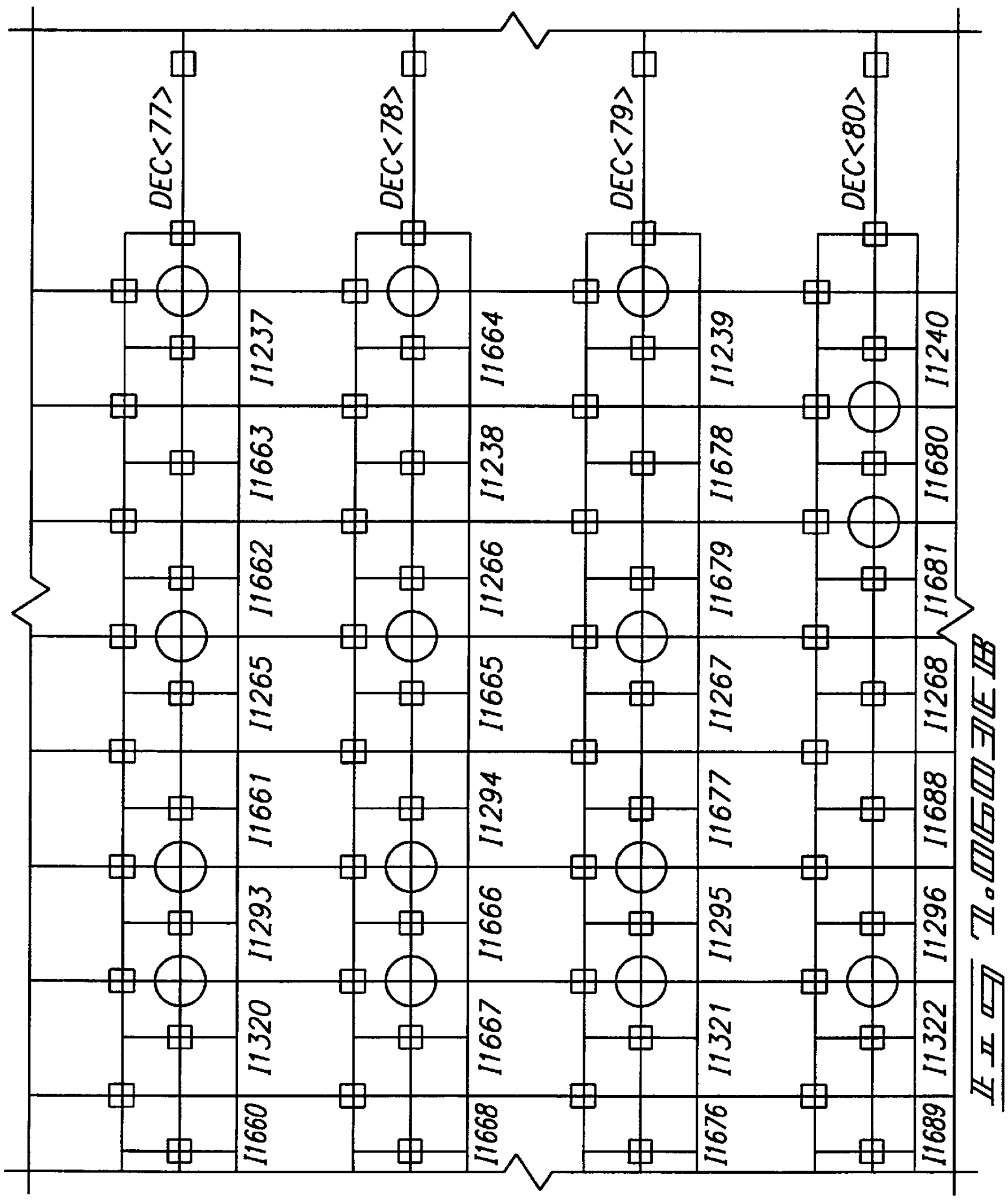
FIG. 7.0603EB

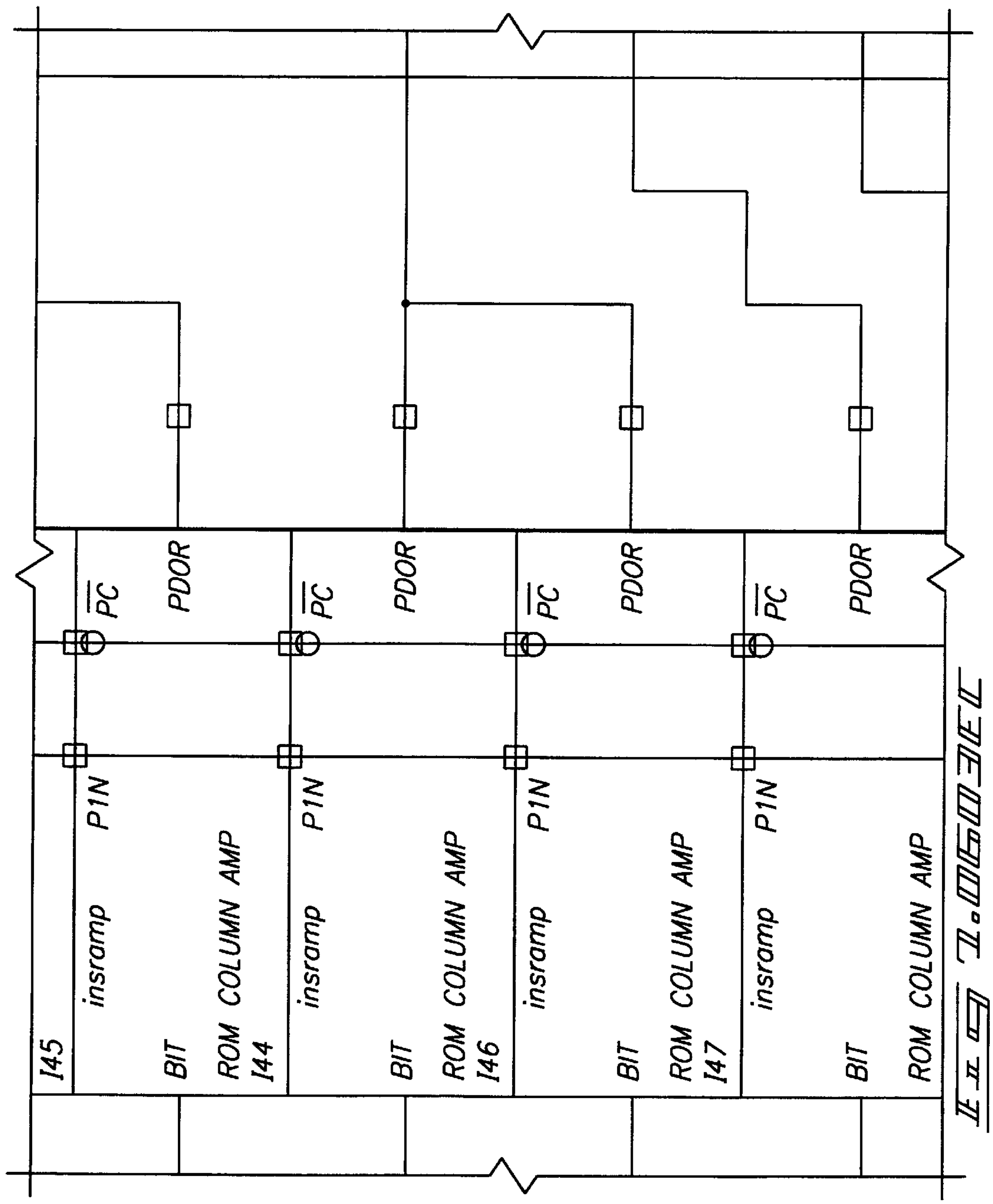
FIG. 1.0603EC

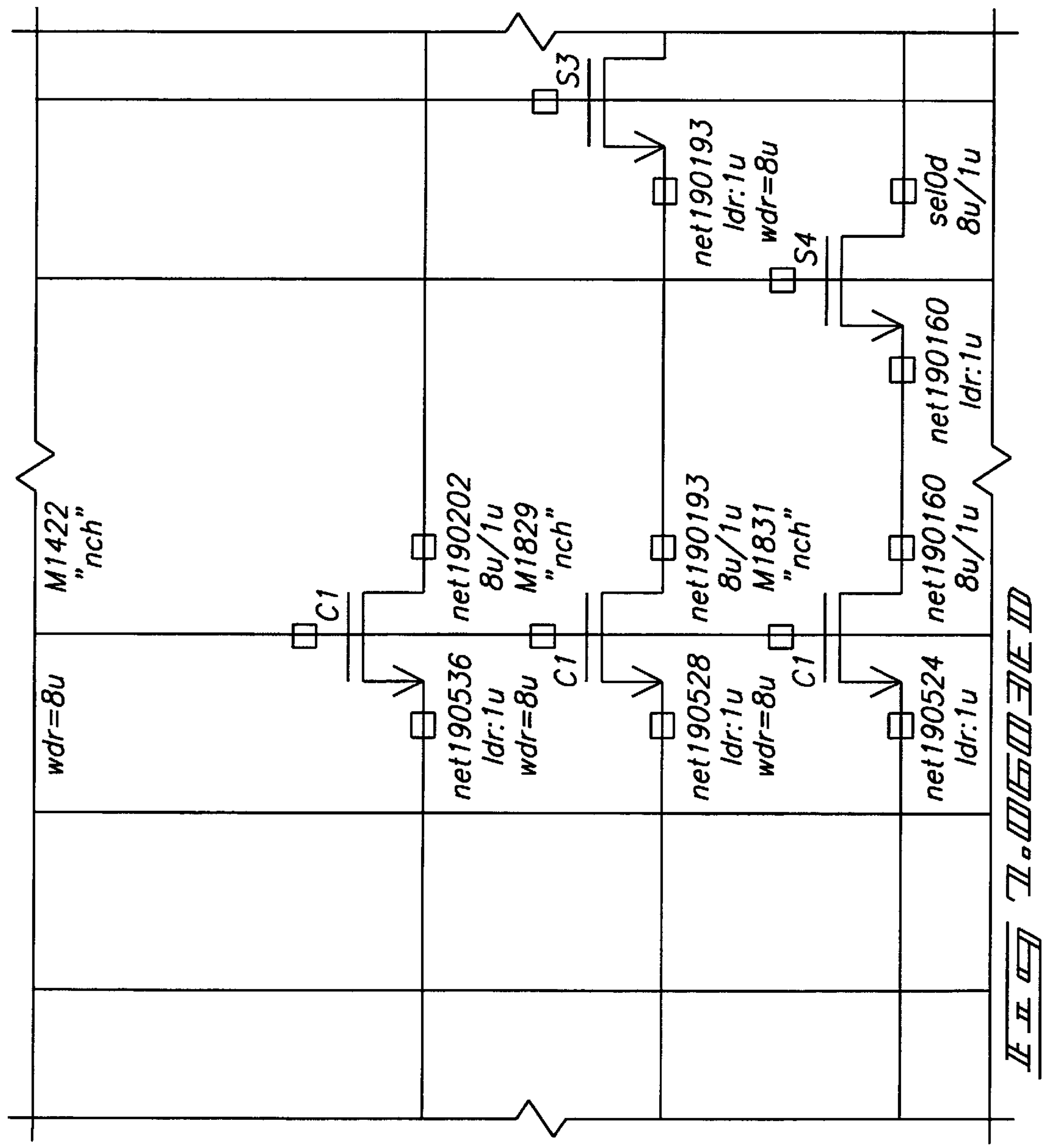
FIG. 7.0603ED

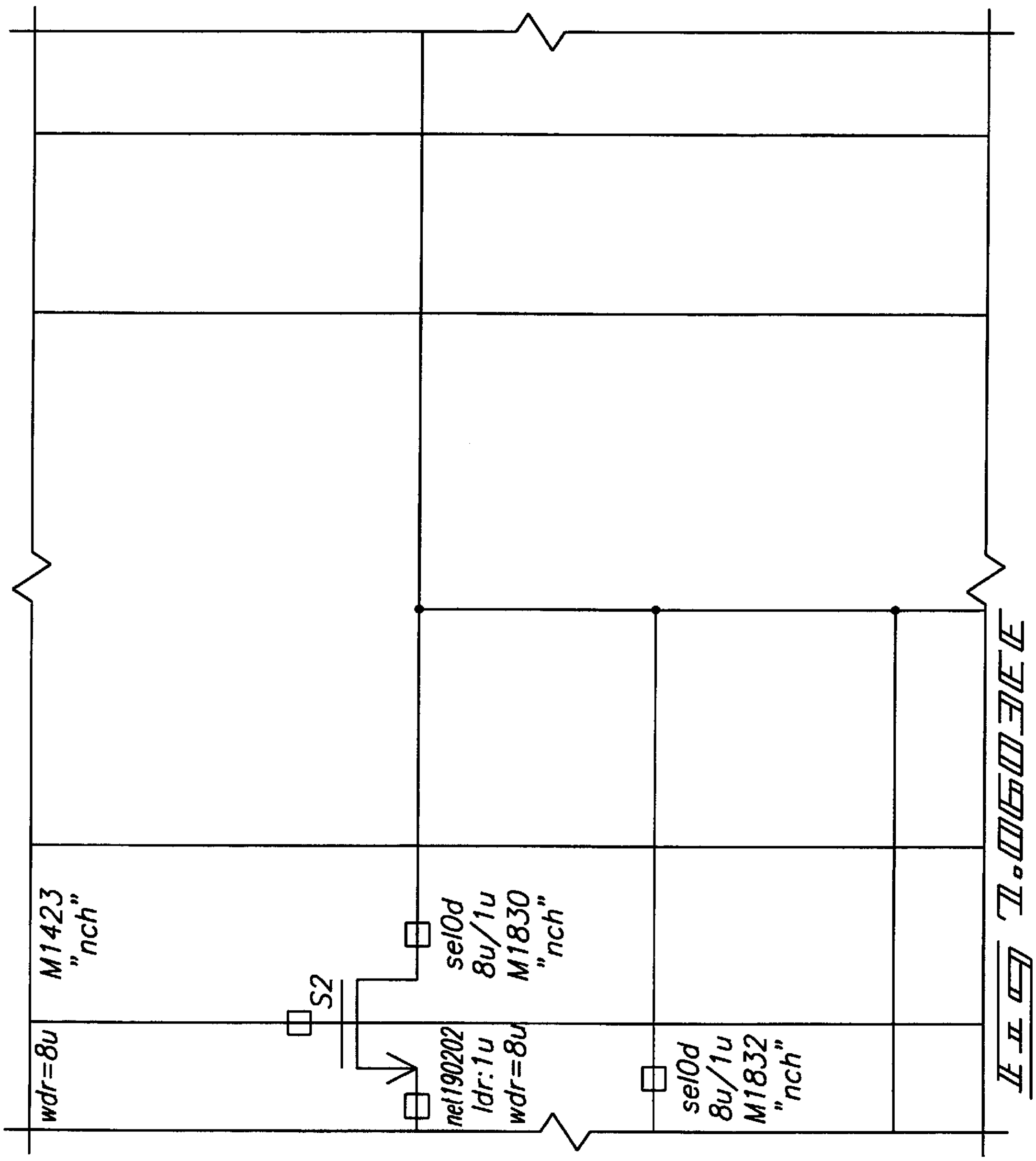
FIG. 1.060.3EE

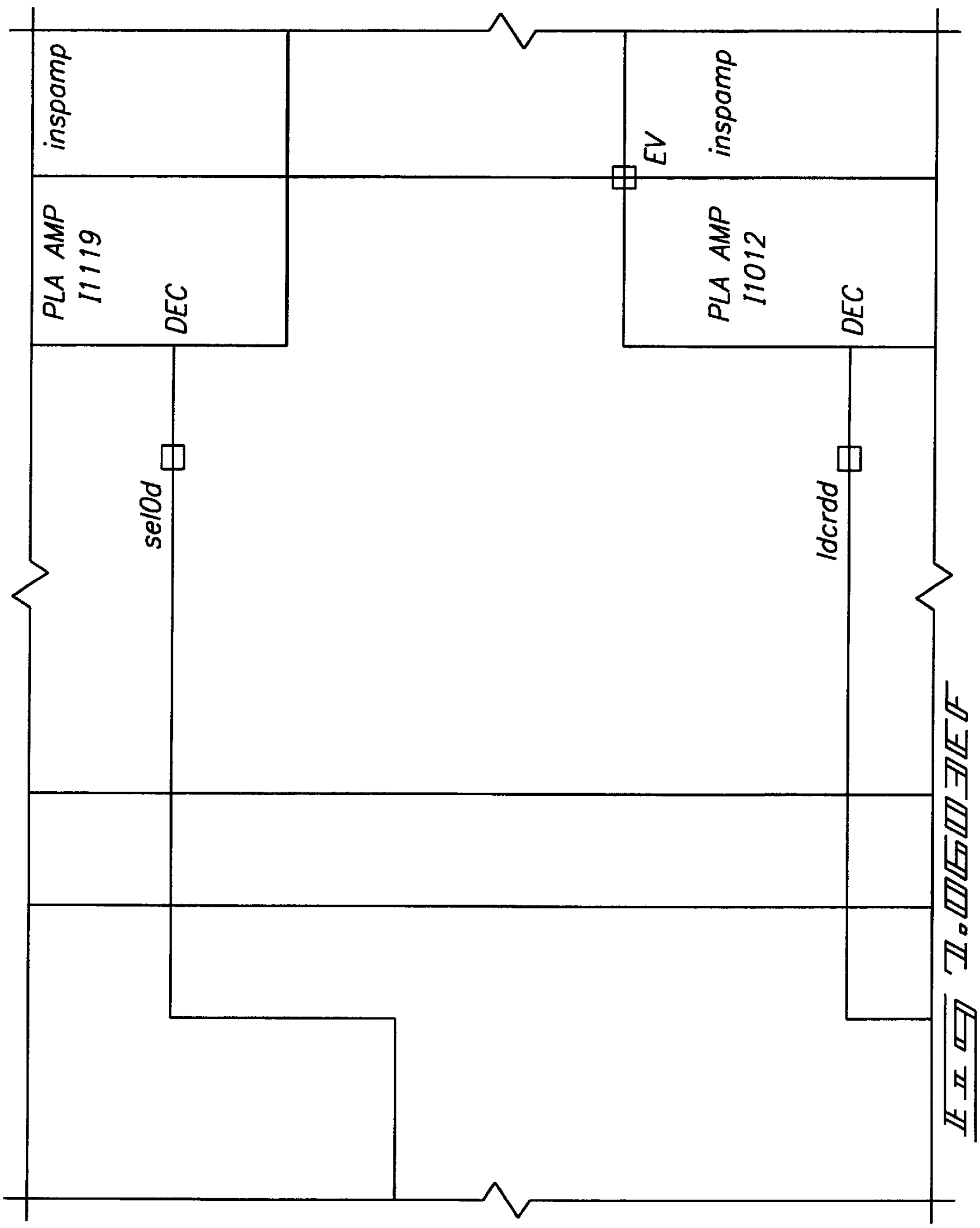
FIG. 7.0603EF

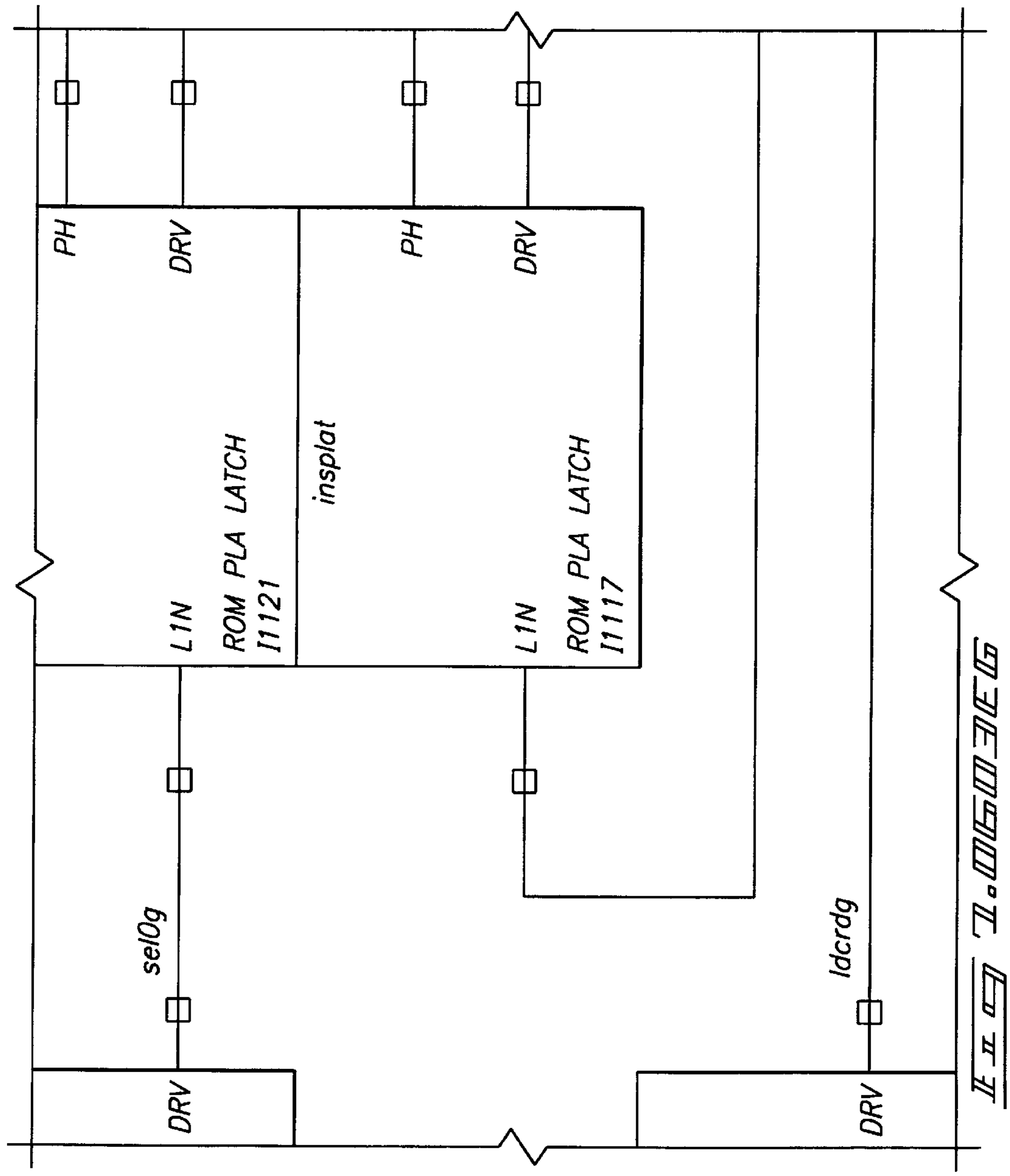
FIG. 7.0603EG

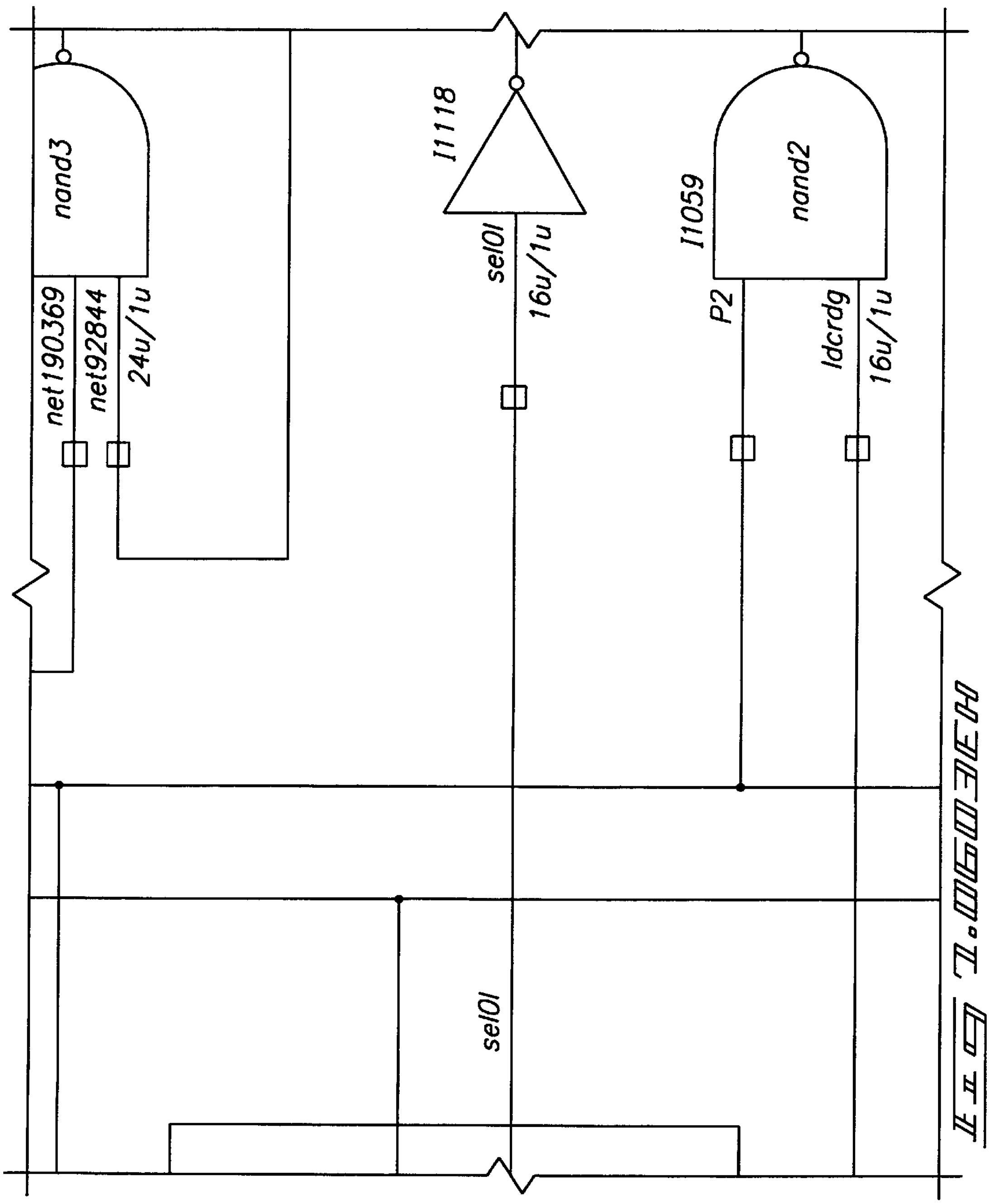
FIG. 7.068DEH

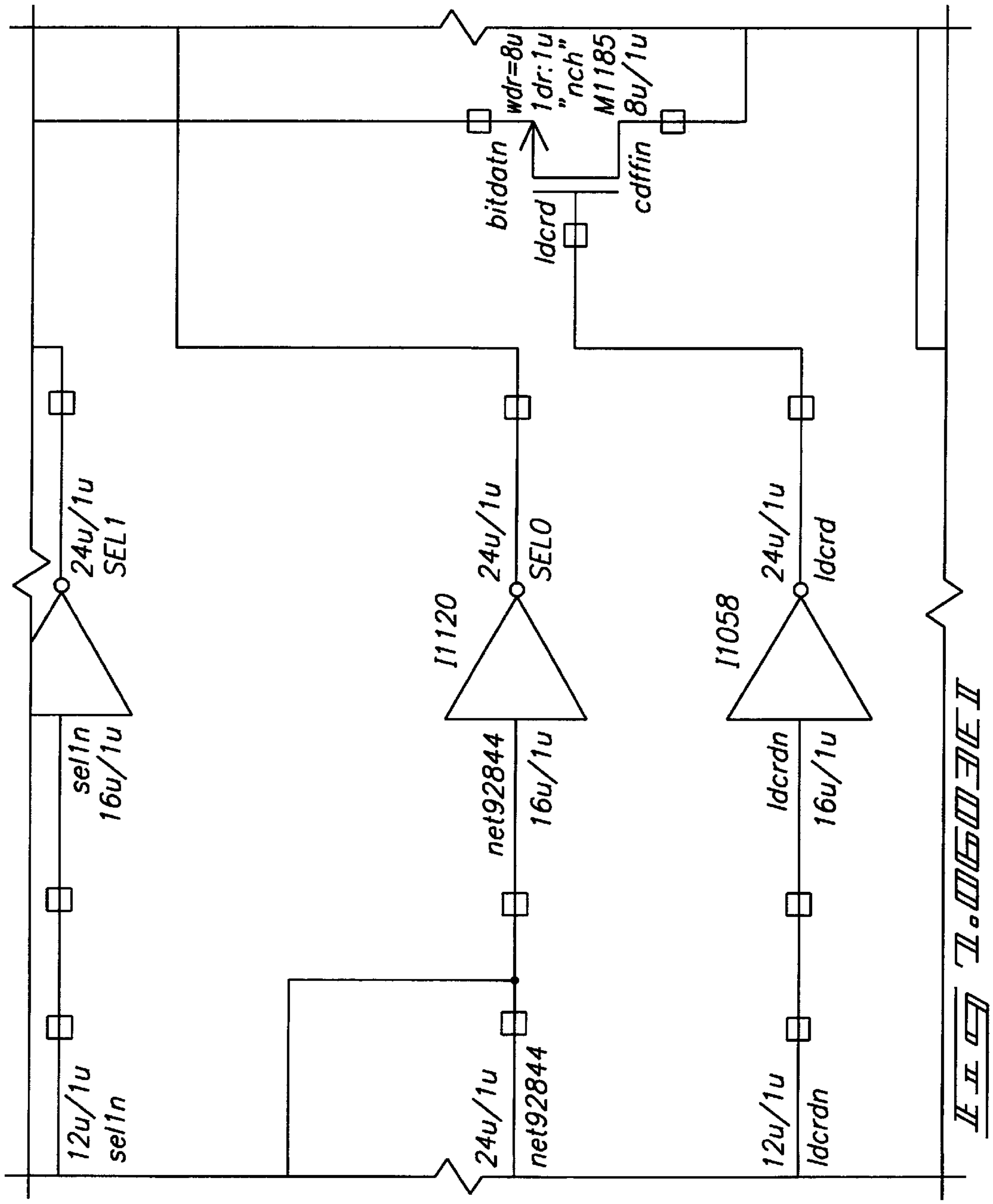
Fig. 7.0603E.II

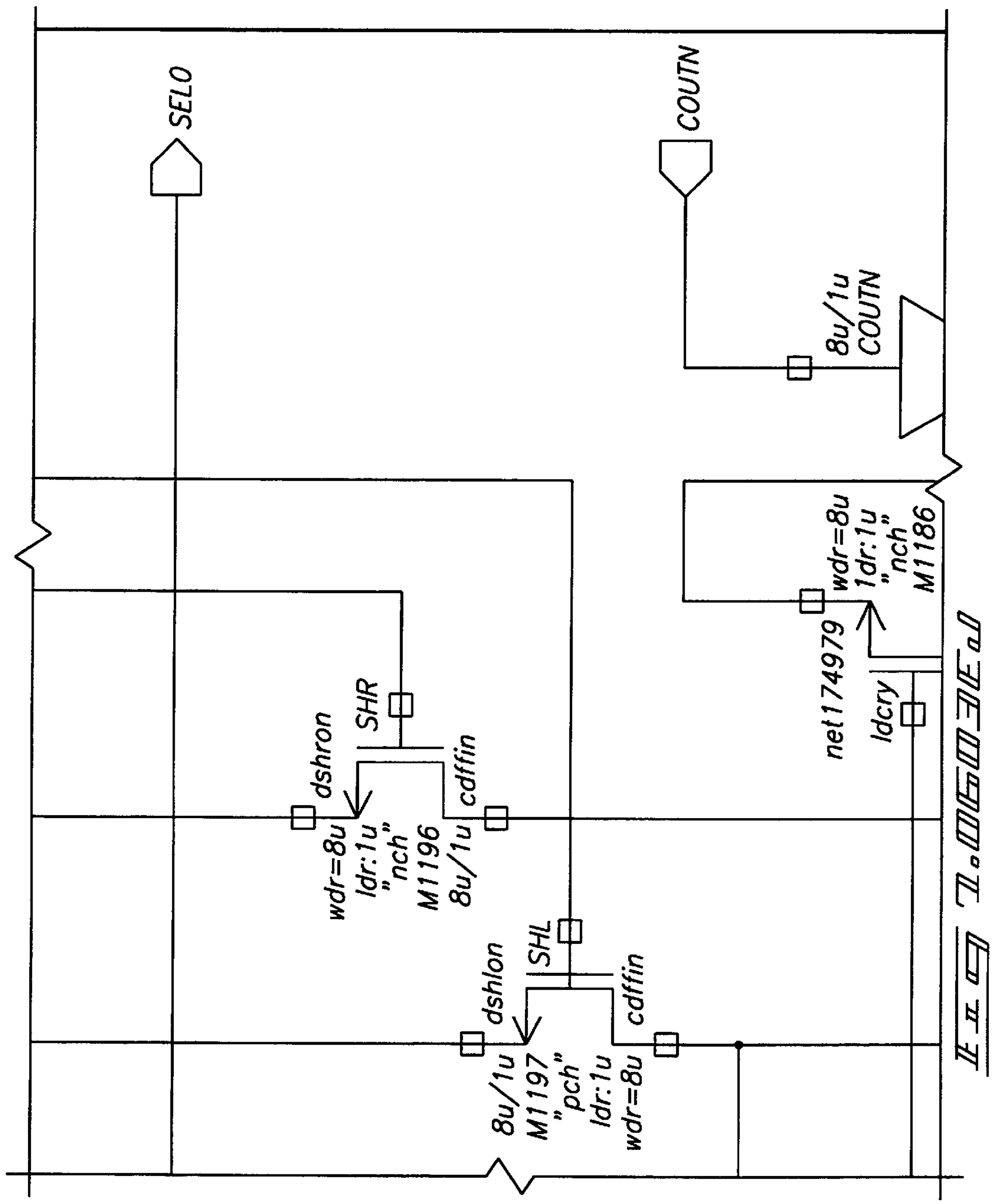
Fig. 7.06G3E

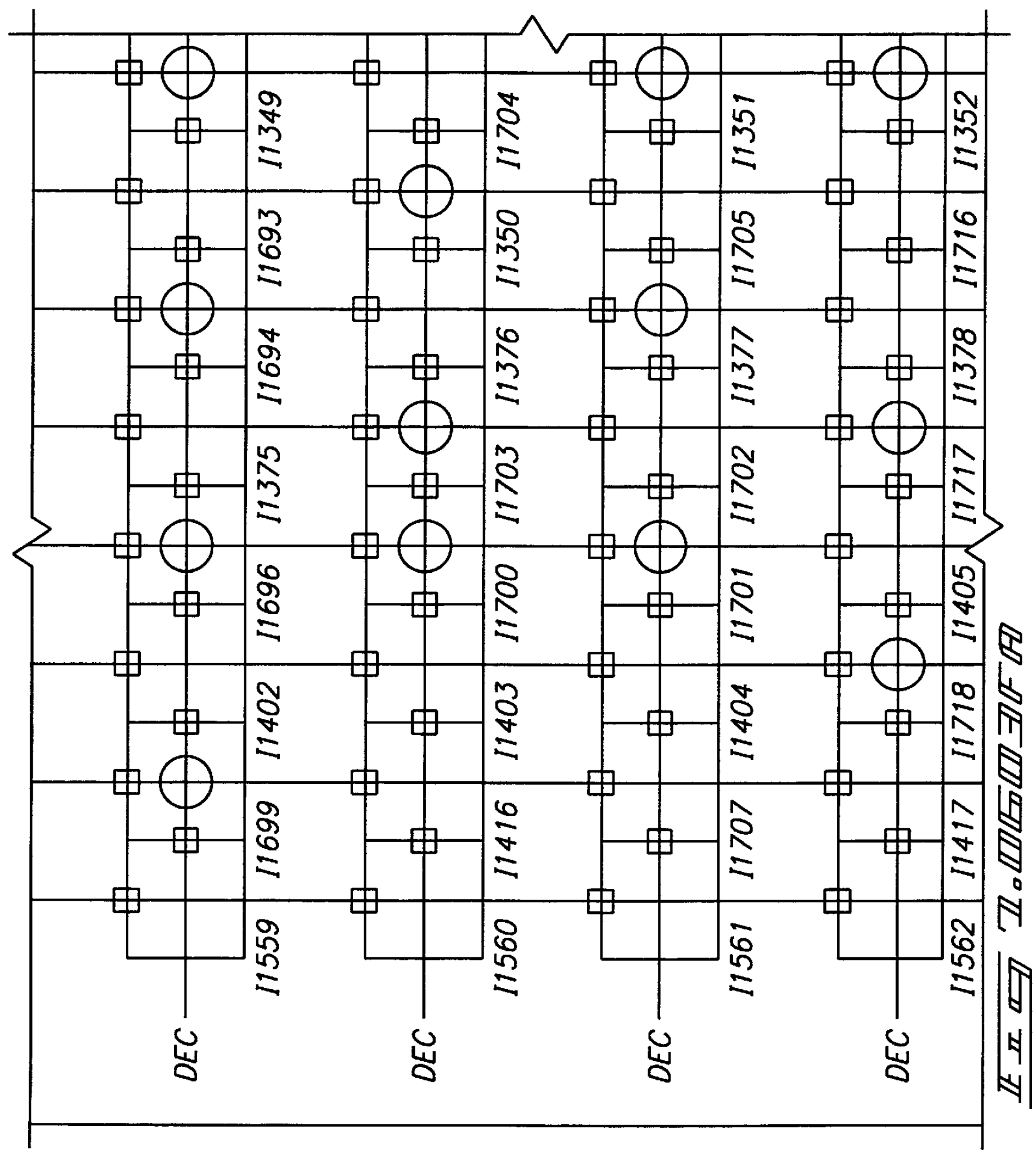
Fig. 7.06.03FA

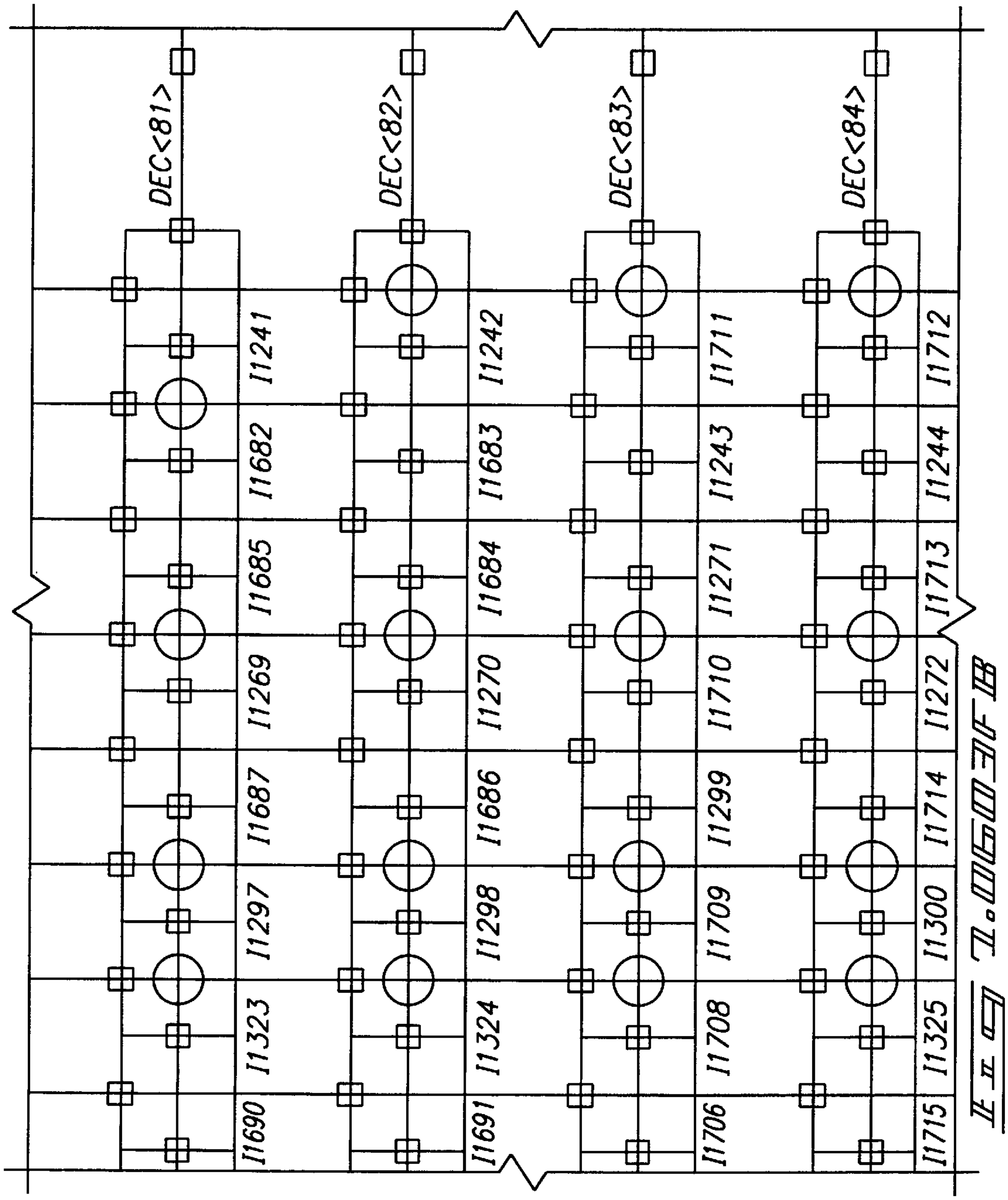
Fig. 7.060.3FB

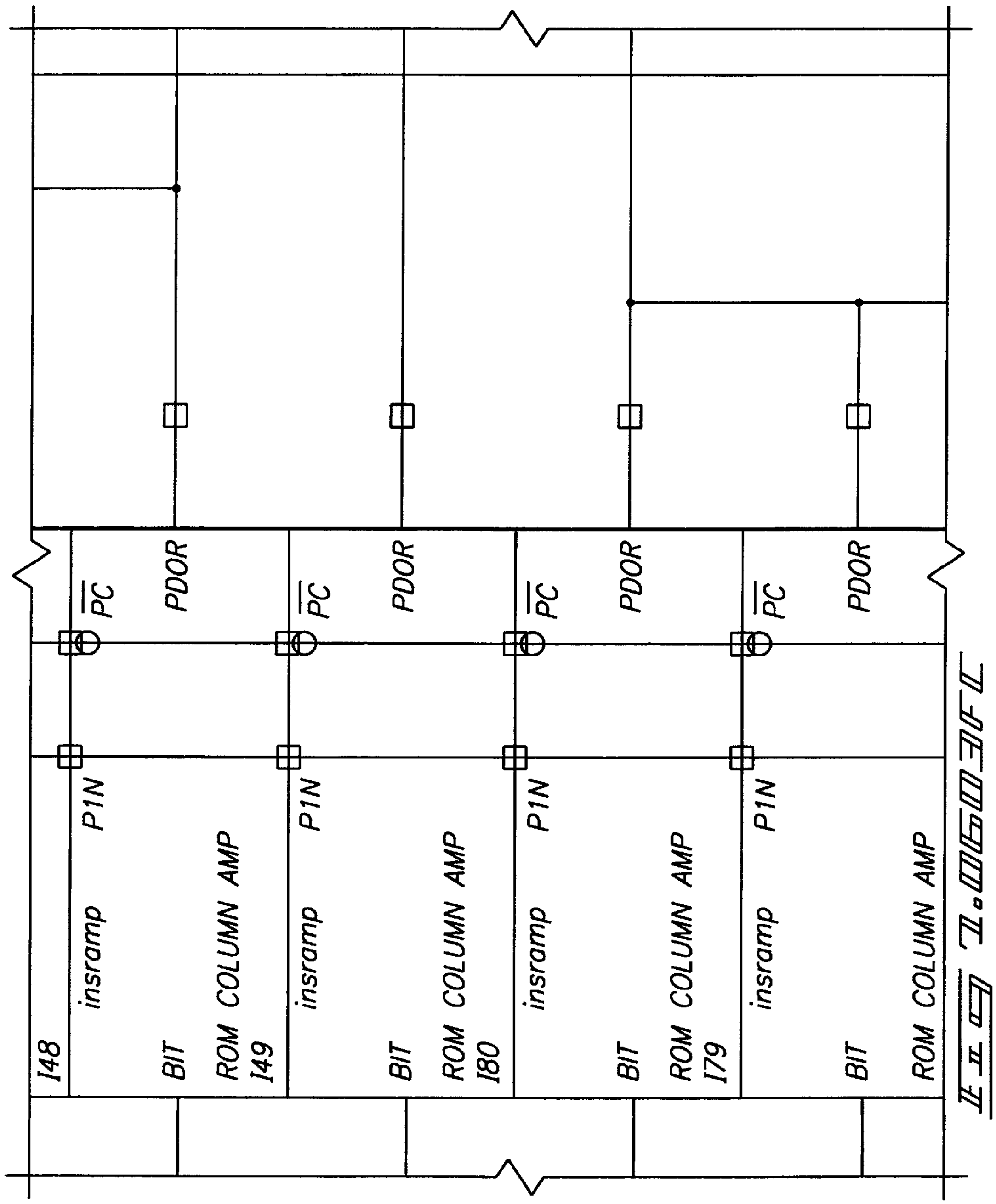
Fig. 7.06G3FC

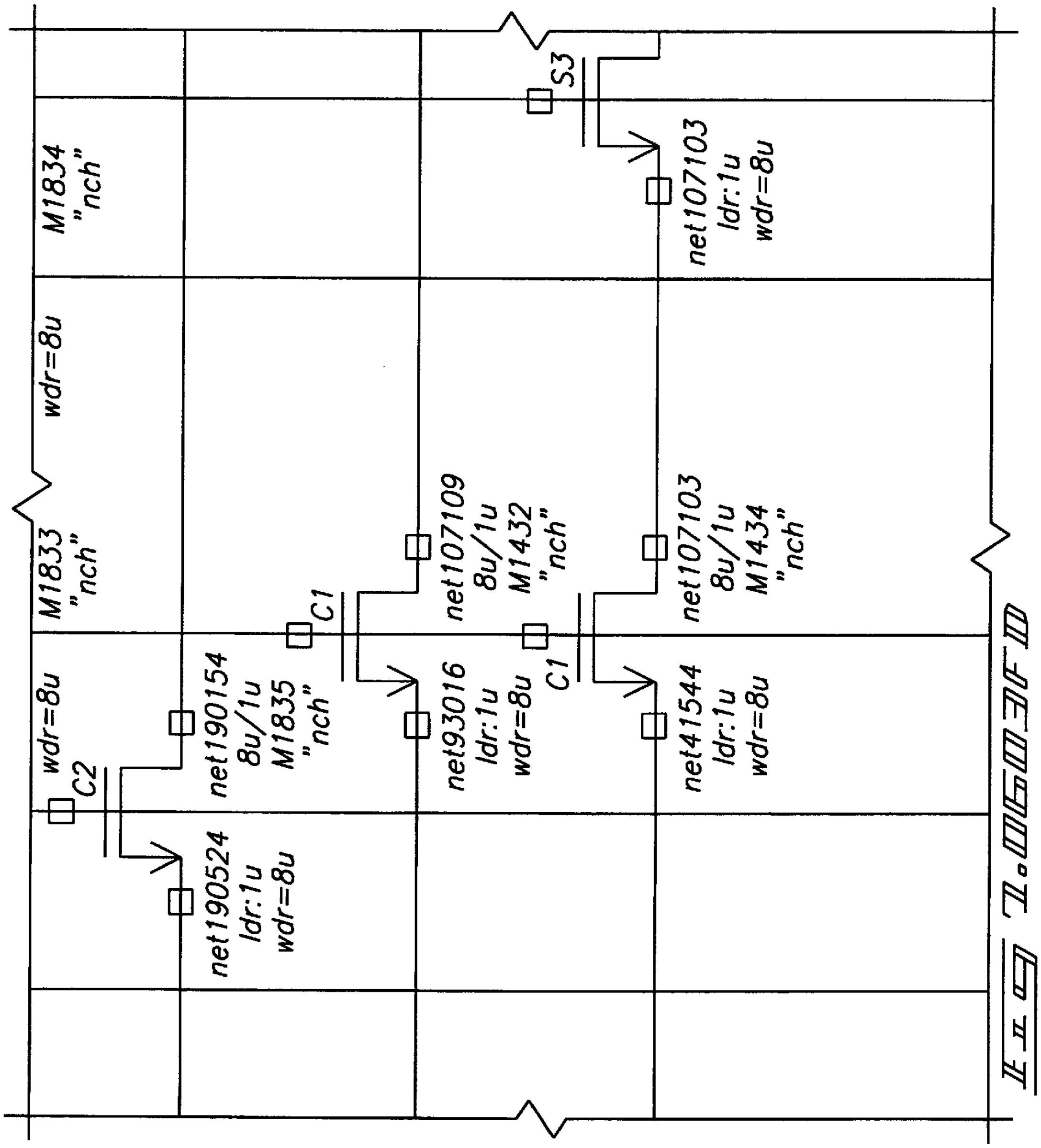
Fig. 7.0603FD

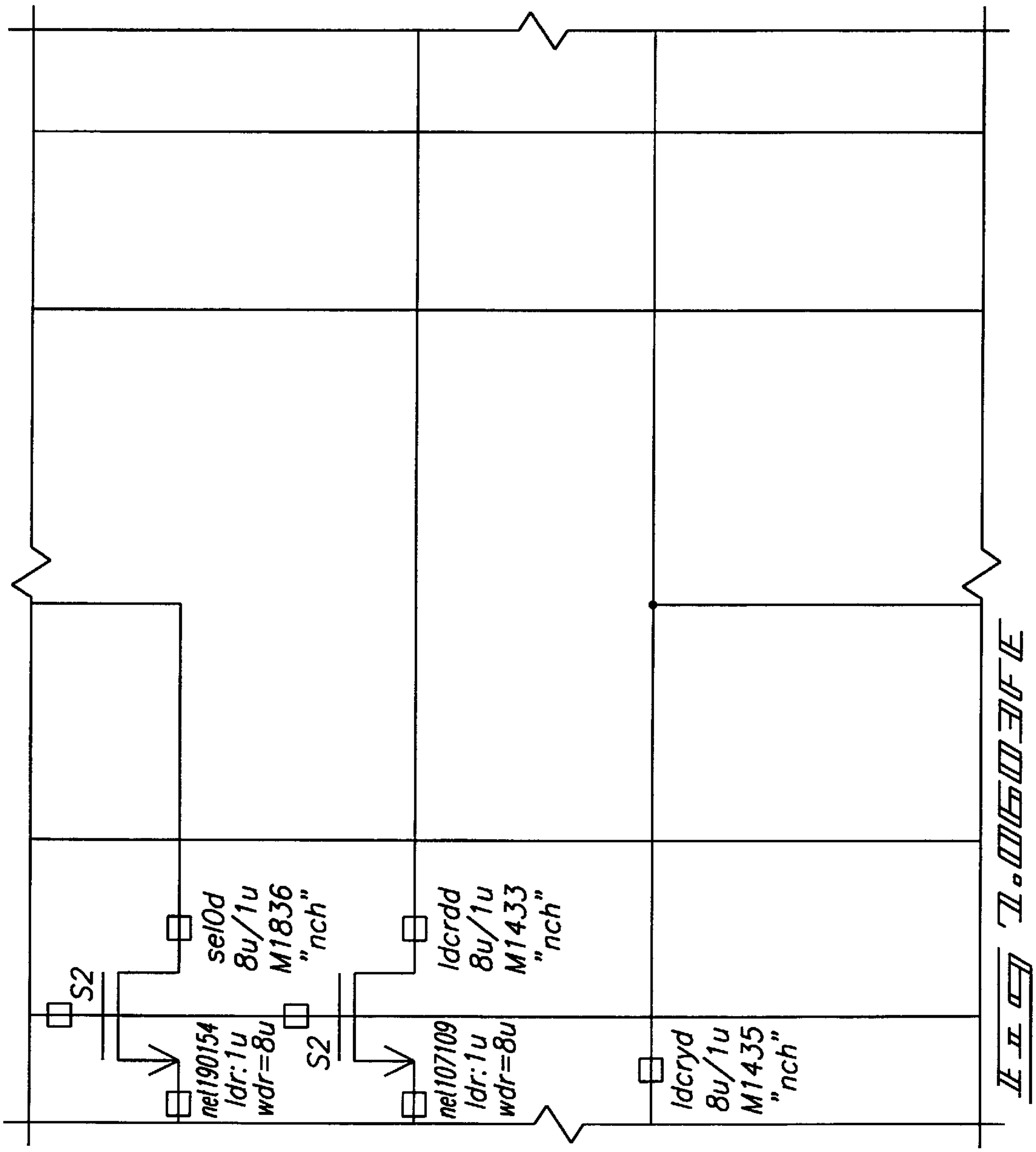
FIG. 7.060AFE

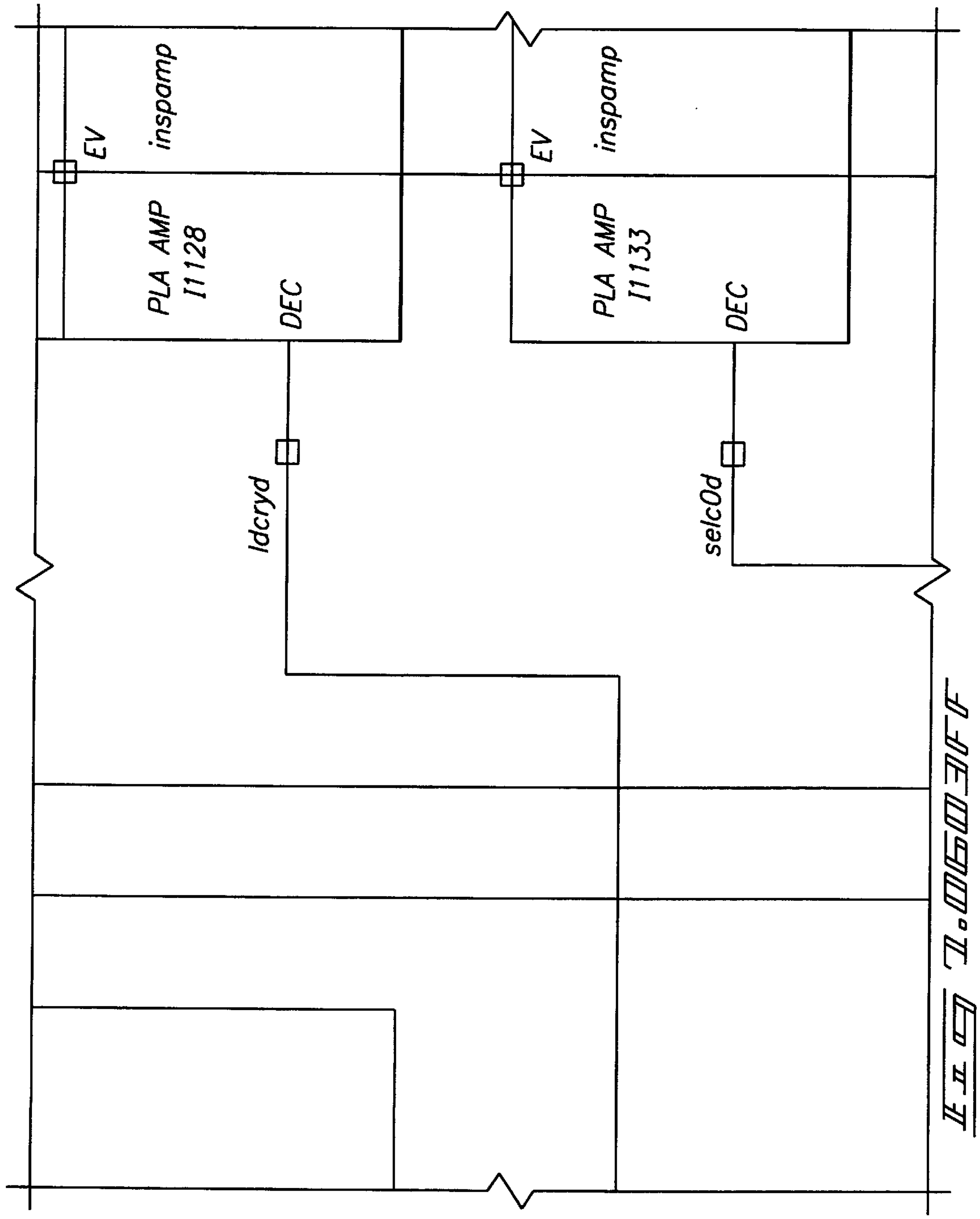
FIG. 7.0603FF

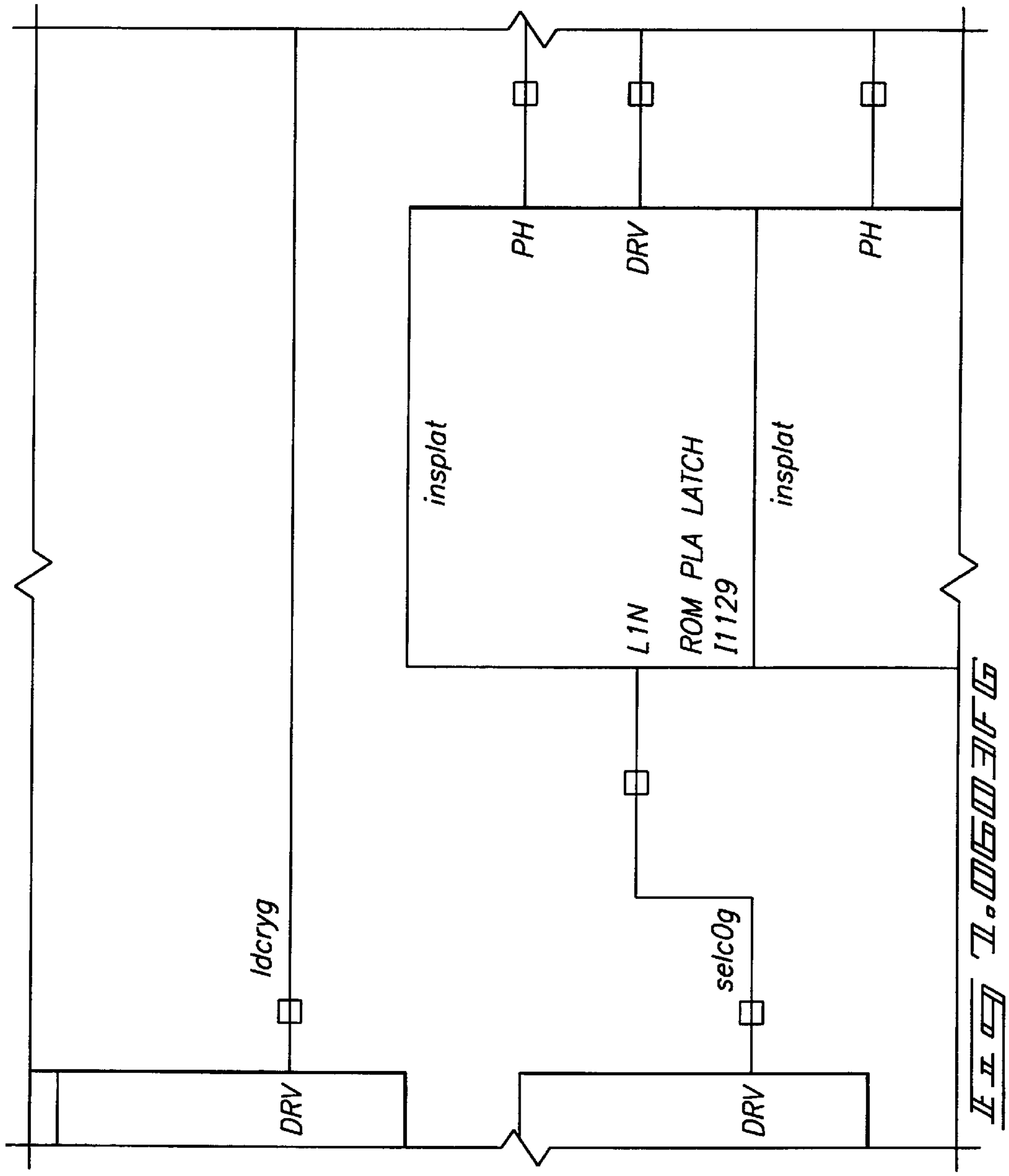
FIG. 7.060.3F6

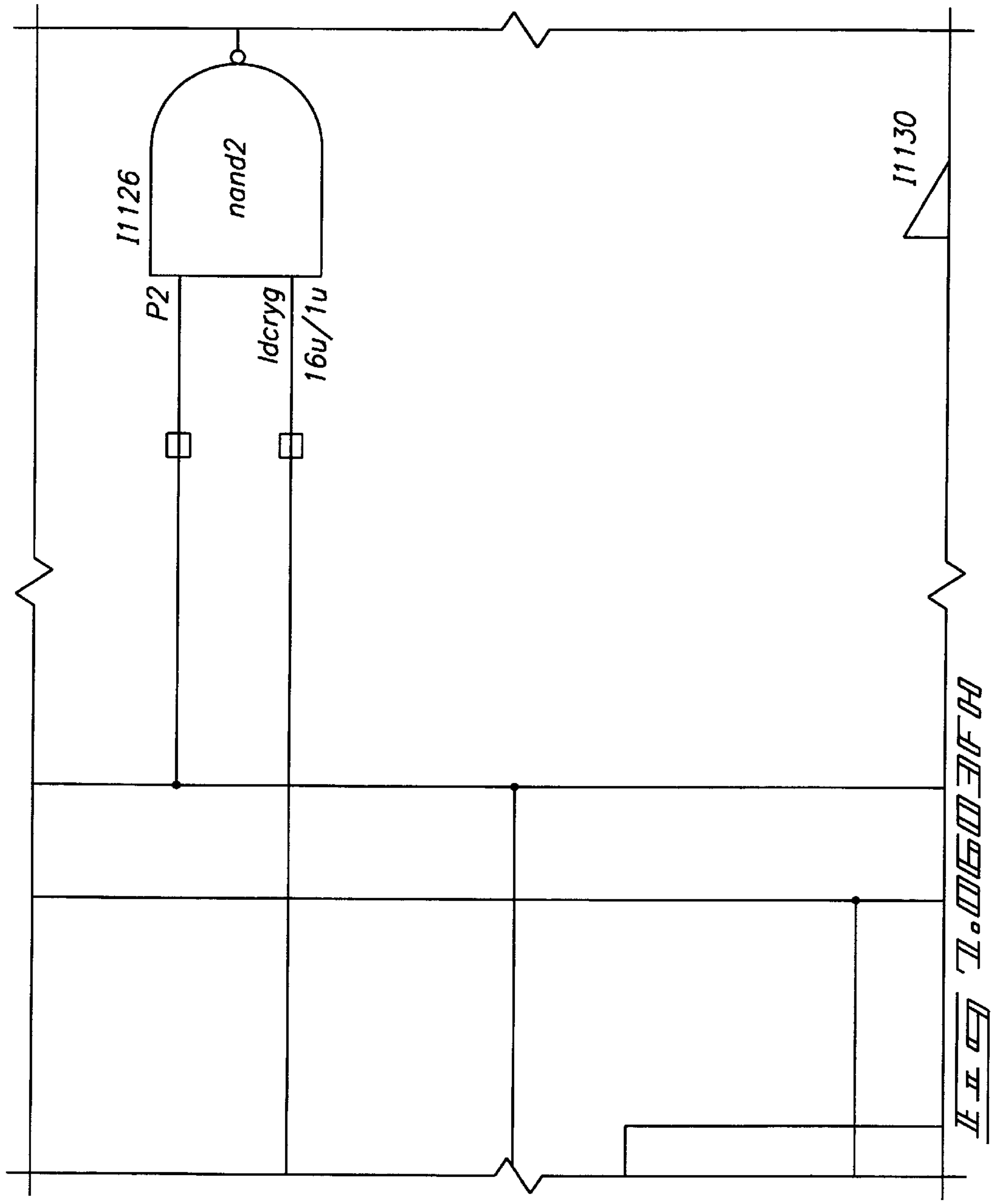
FIG. 7.0690AH

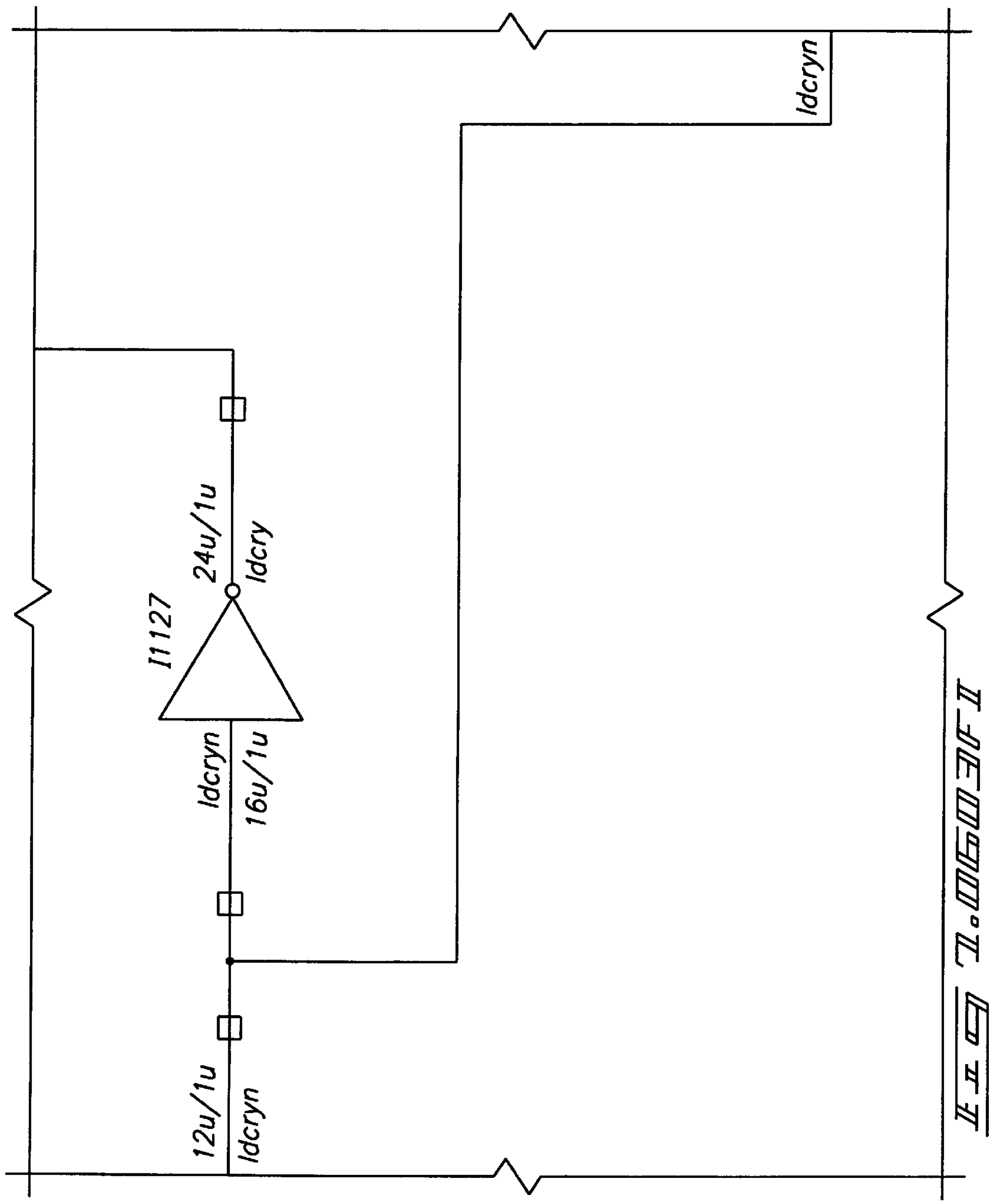
ldcryn
24u/1u
ldcry
I1127
ldcryn
16u/1u
12u/1u
ldcryn

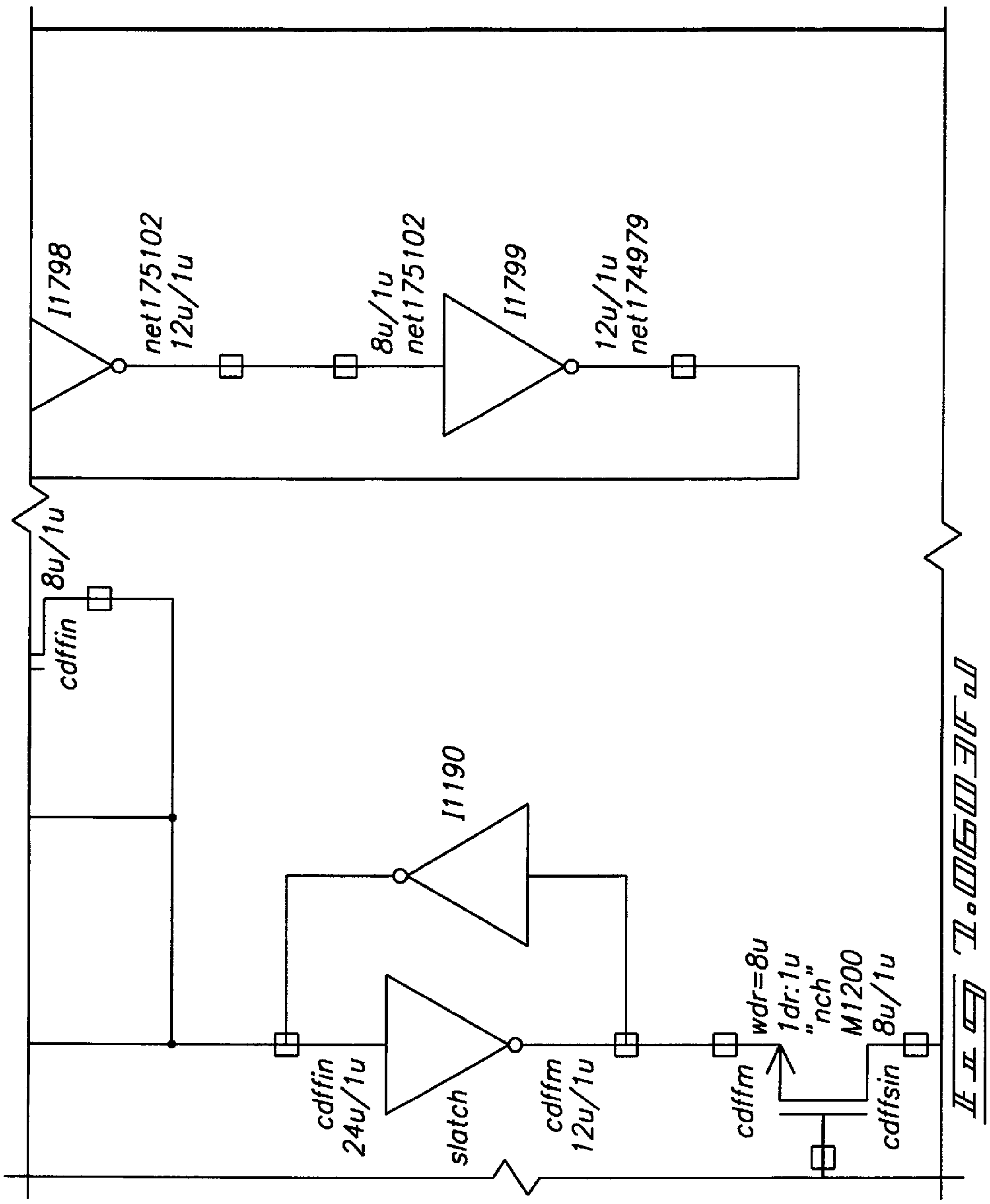
Fig. 7.0603F4

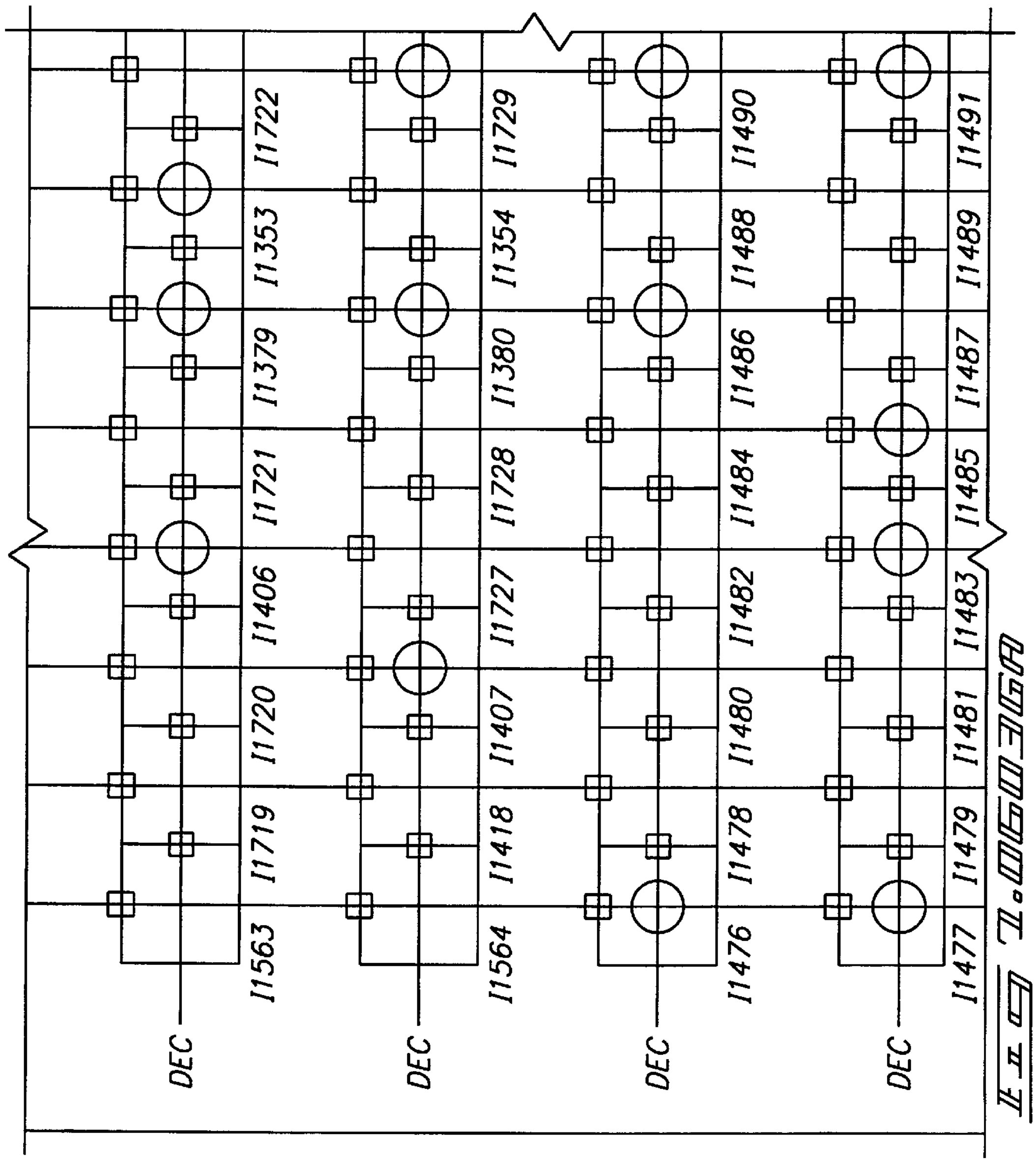
FIG. 7.06G03GA

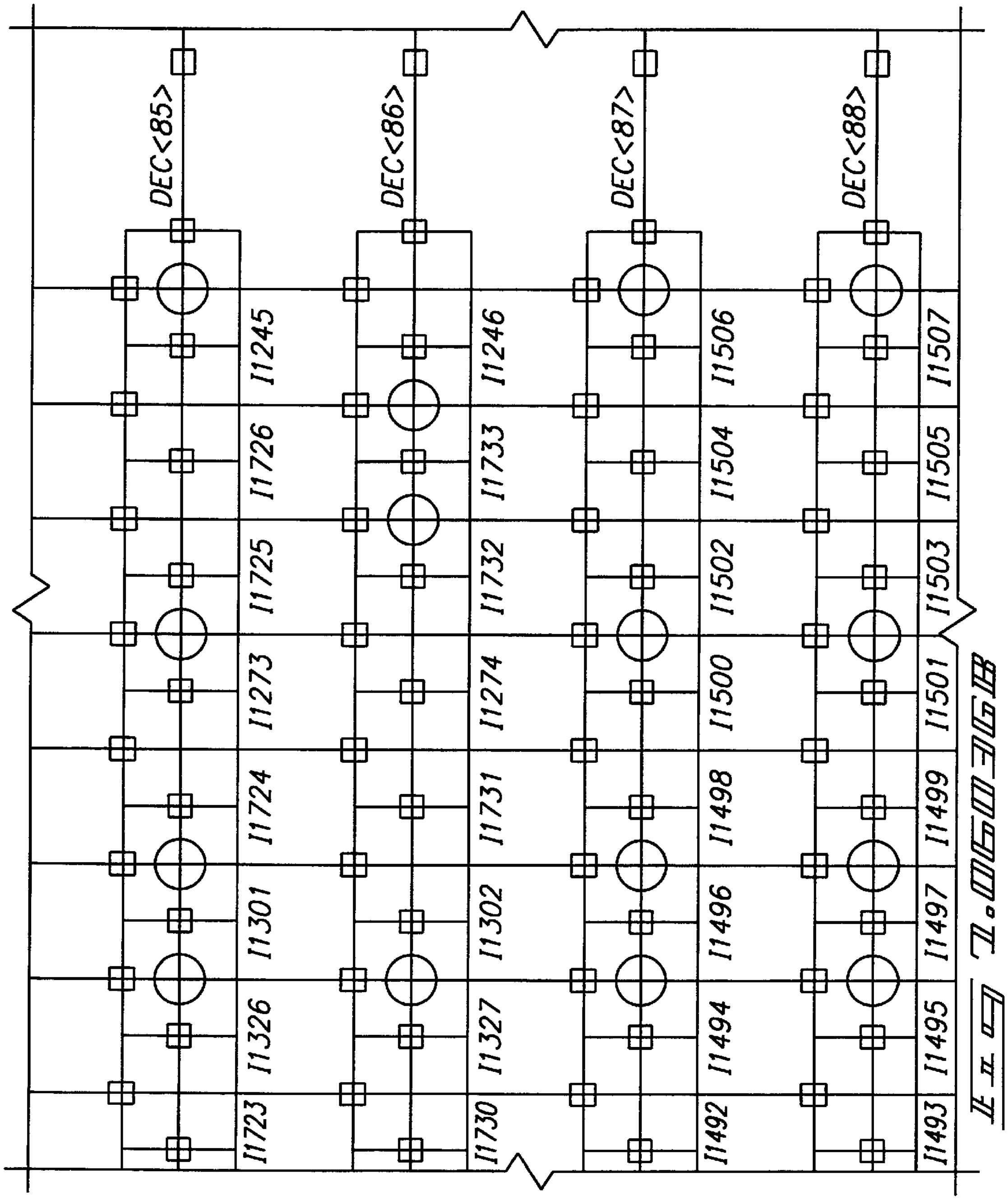
Fig. 7.0603GB

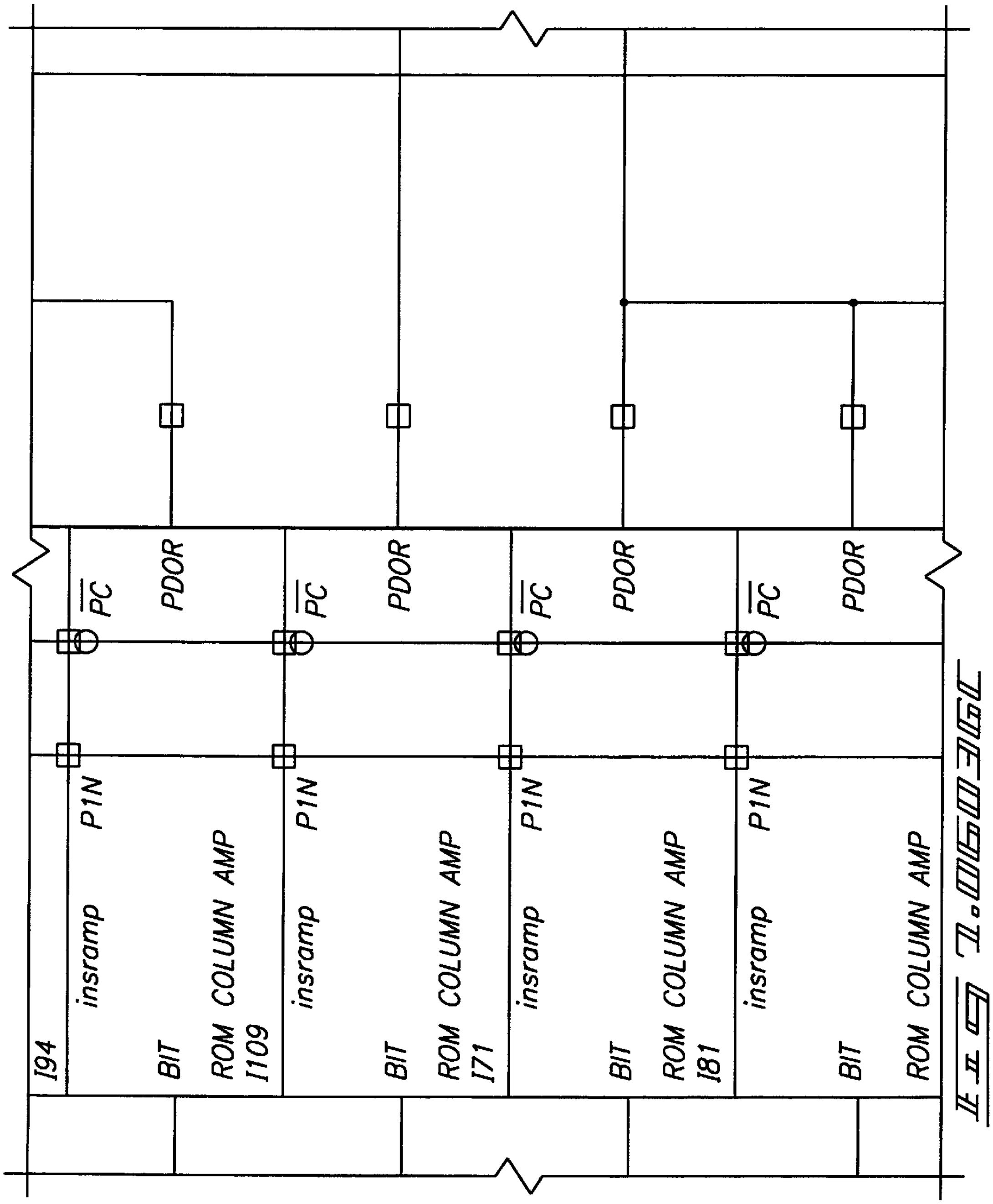
Fig 7.0603GC

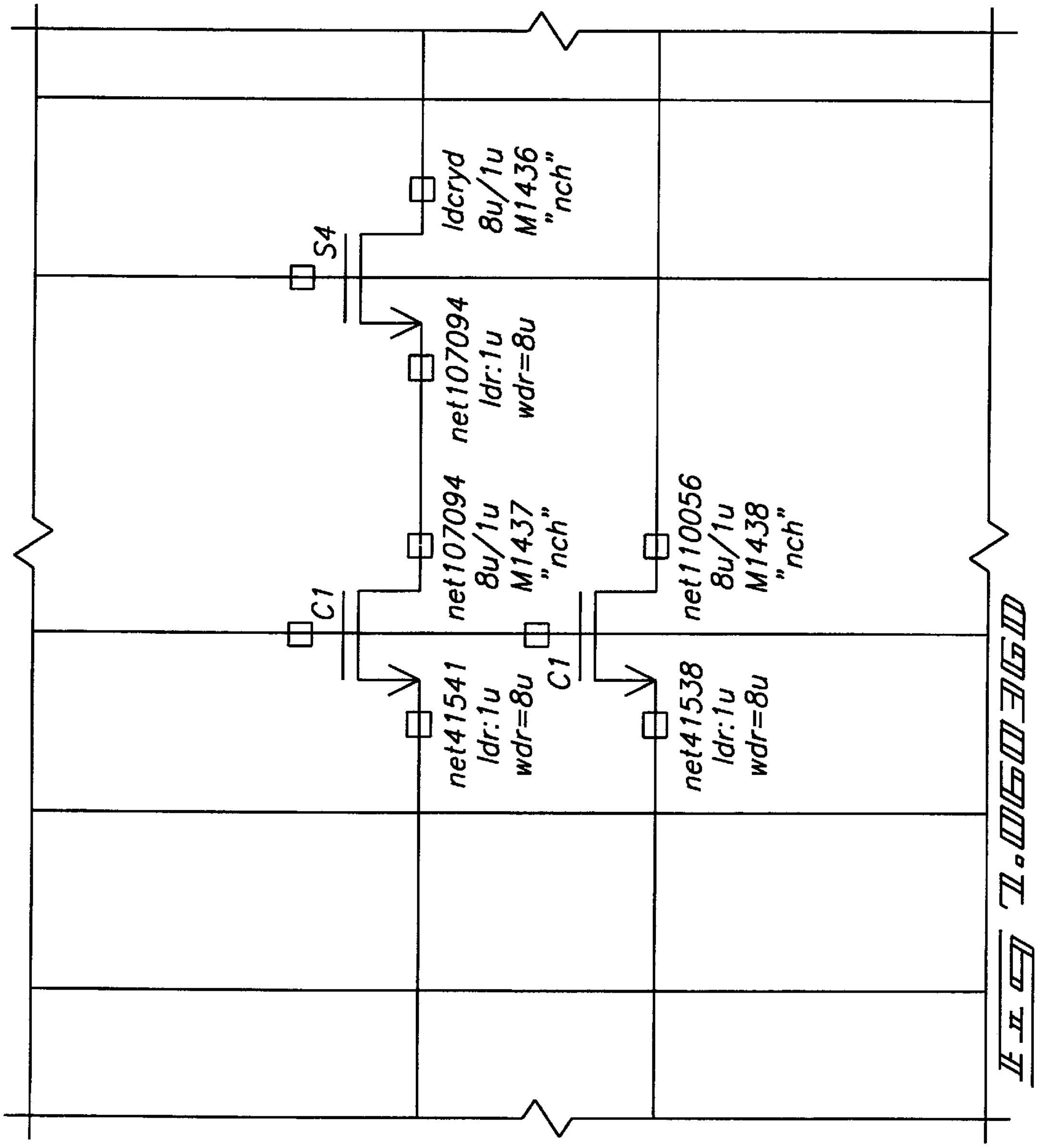
FIG. 7.060EGD

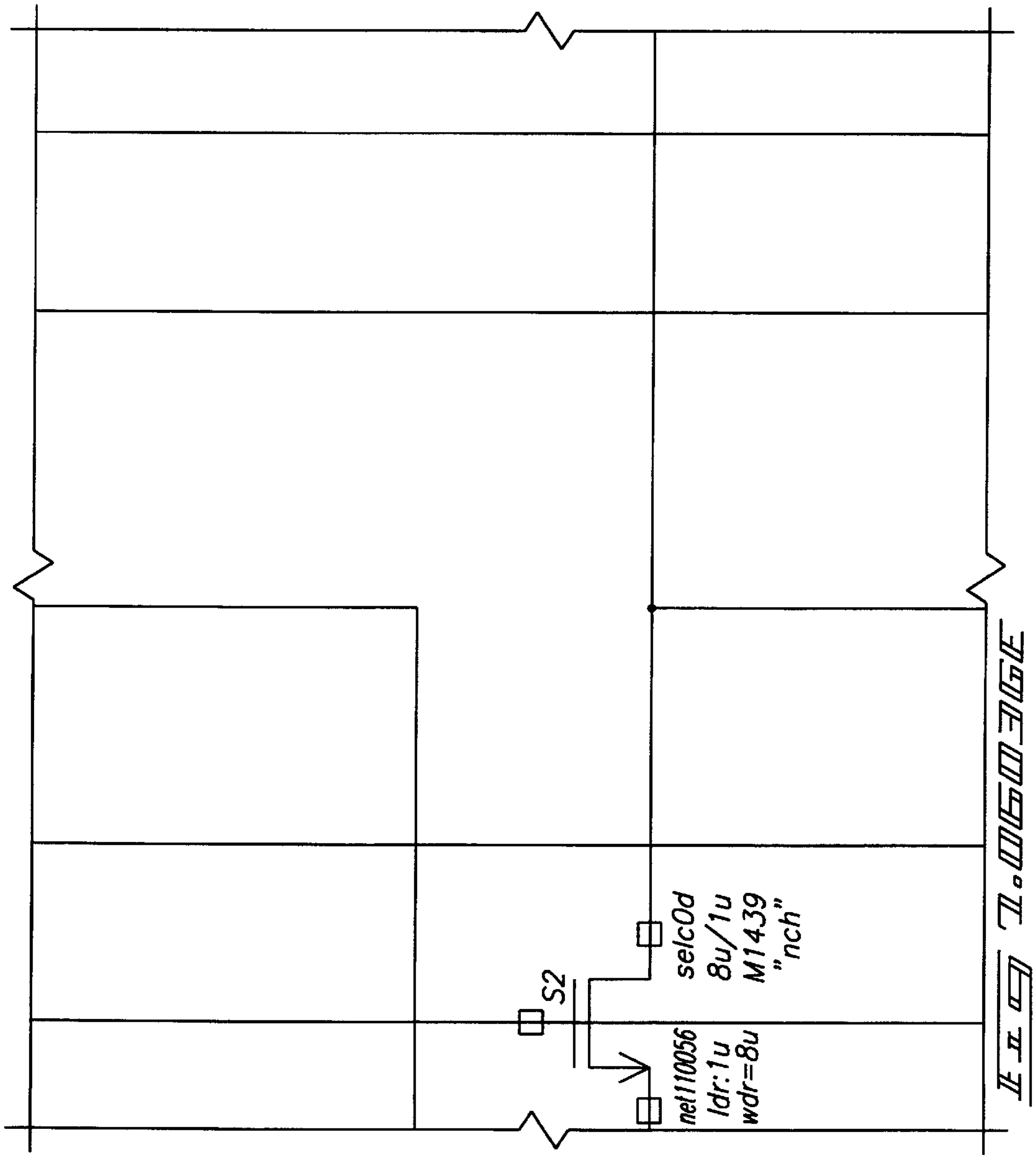
FIG. 7.00603GE

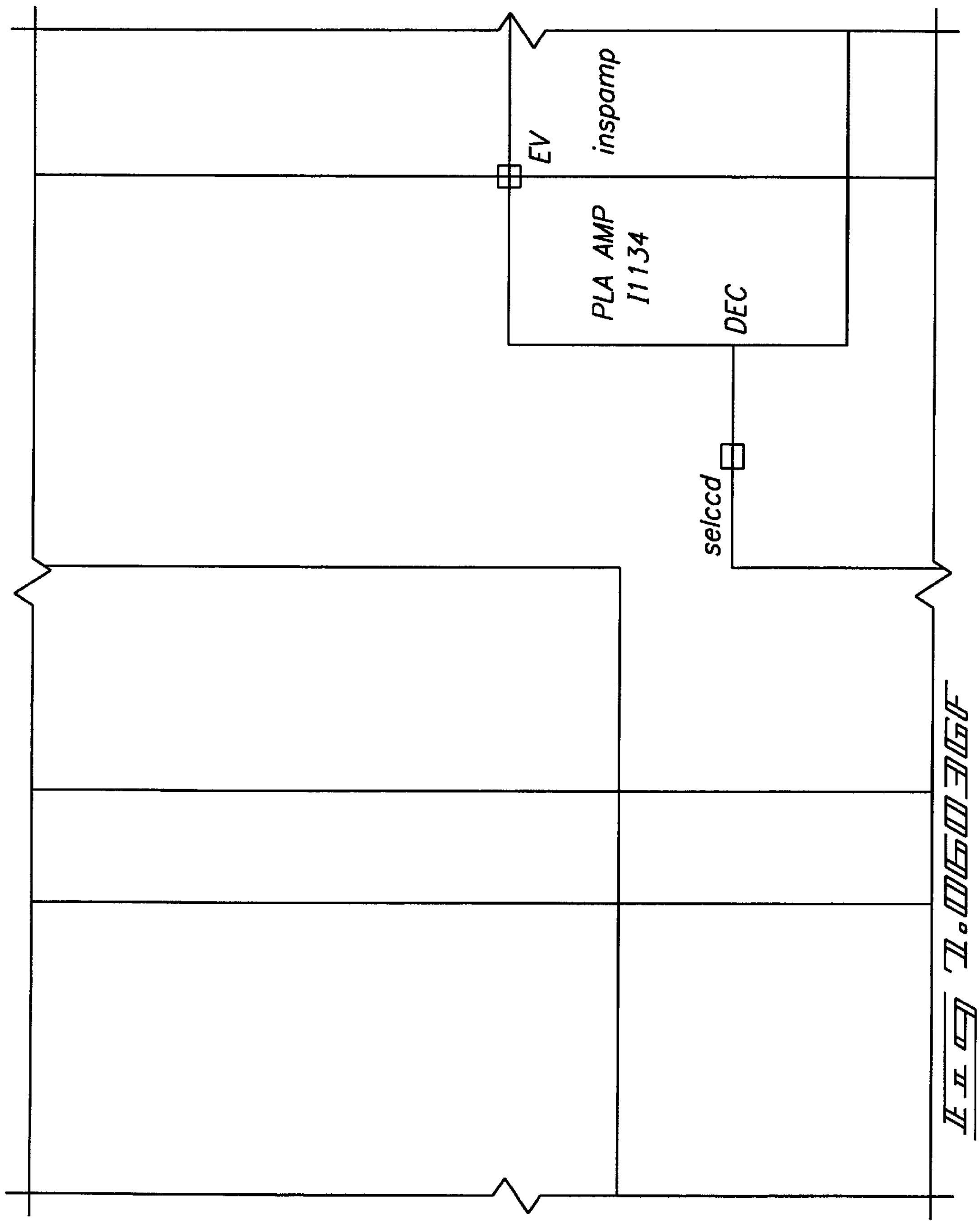
Fig 7.0603GF

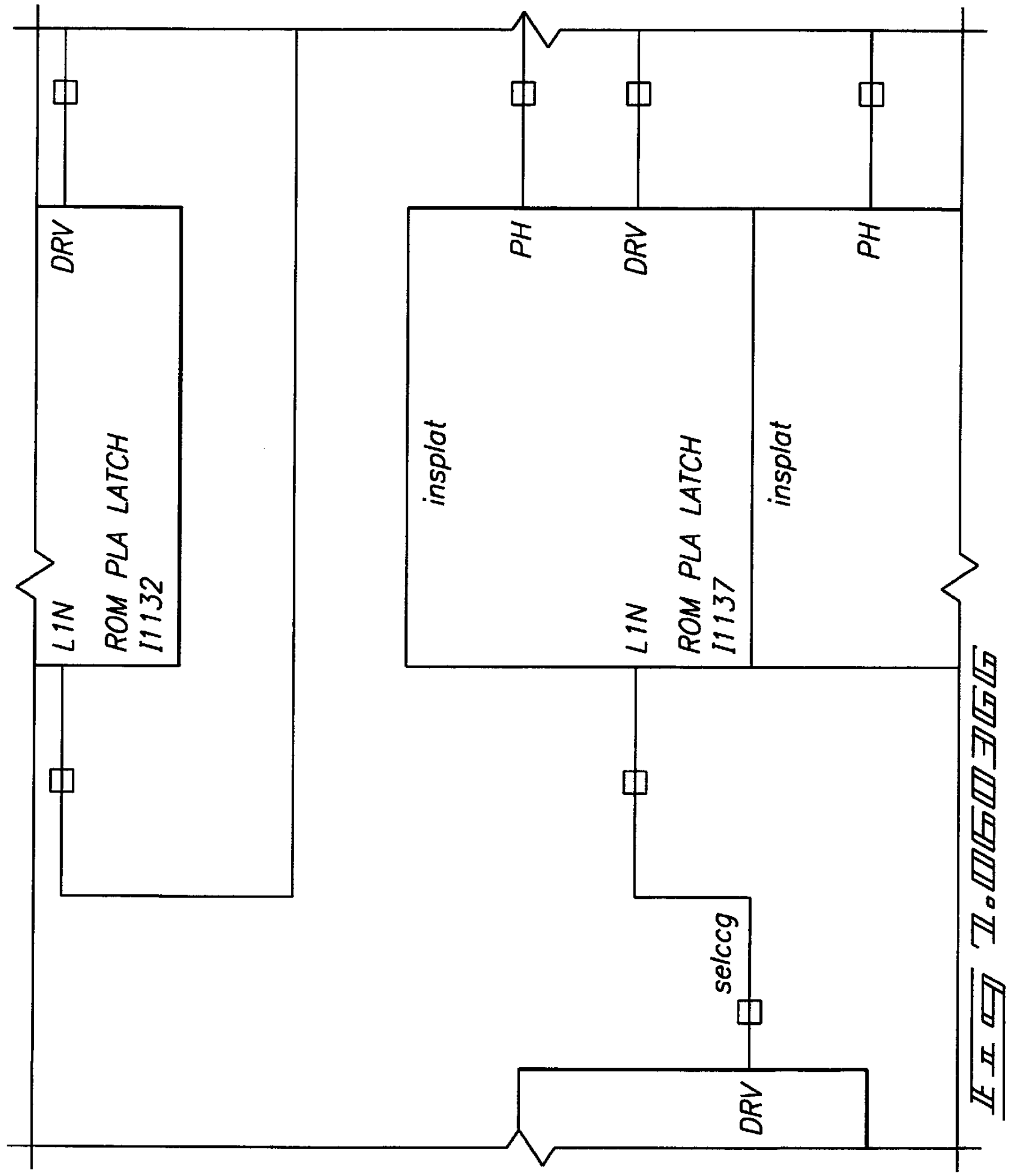
Fig. 7.060366

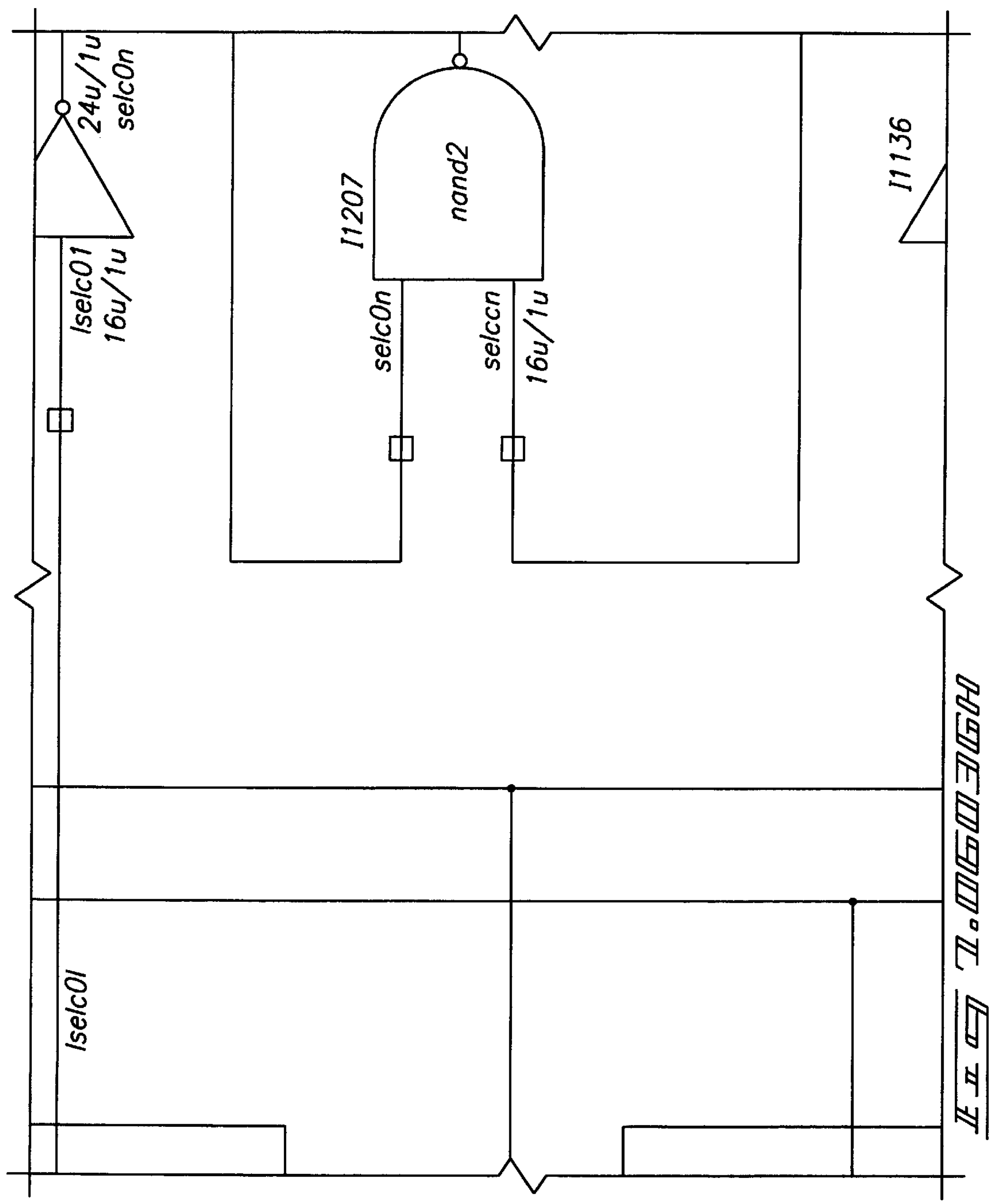
FIG. 7.0603GH

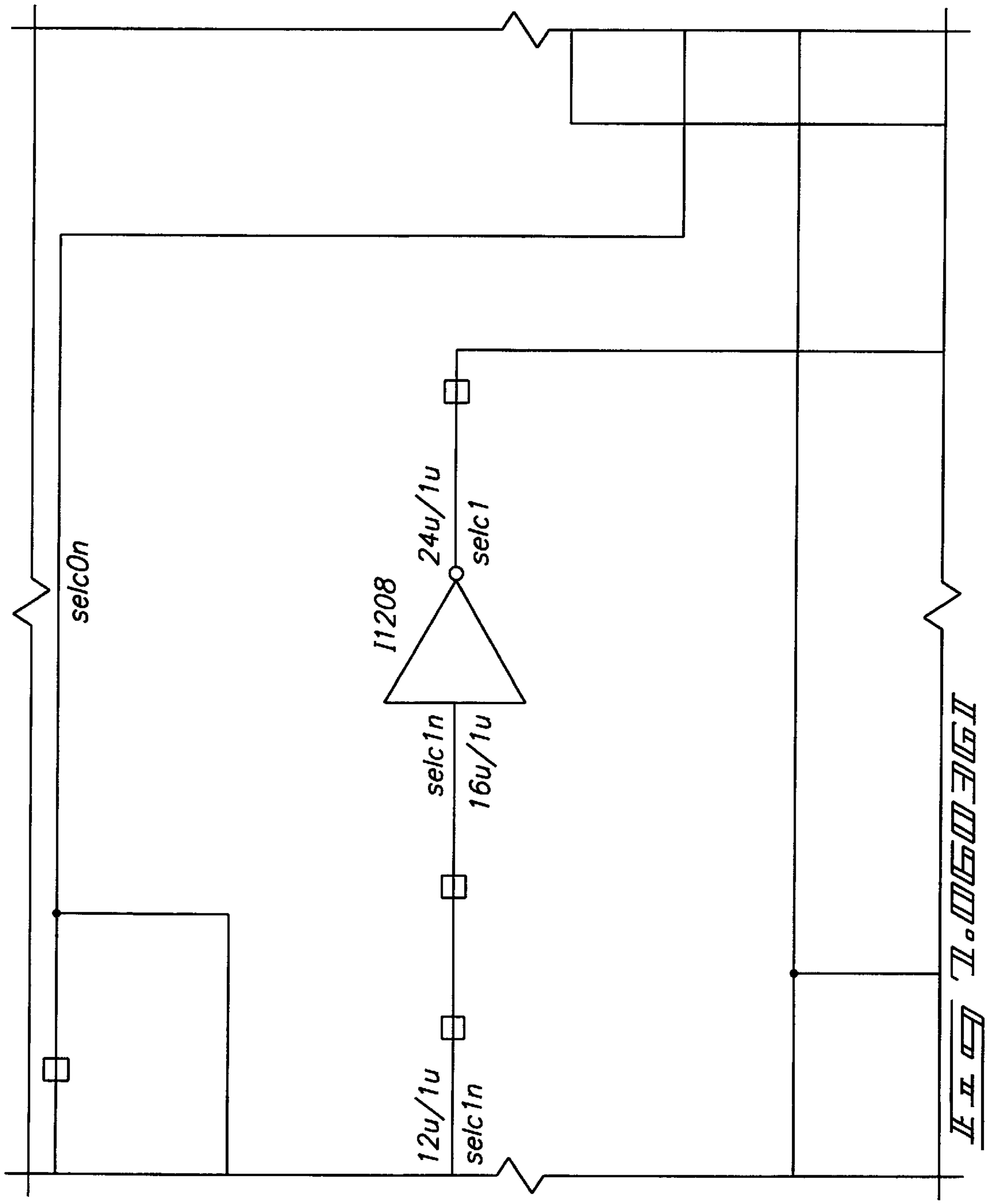
FIG. 7.090E1

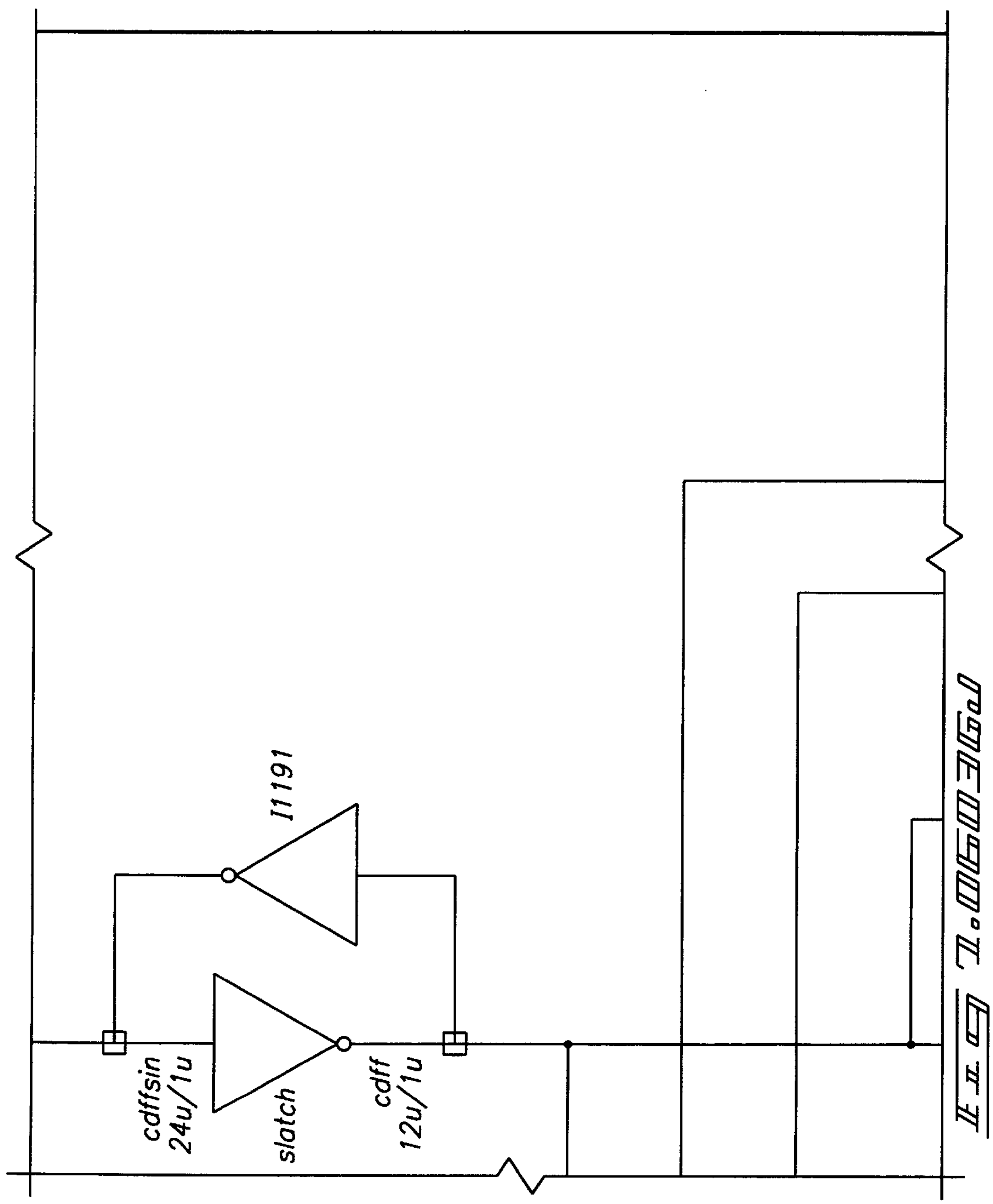
FIG. 7.0090EGJ

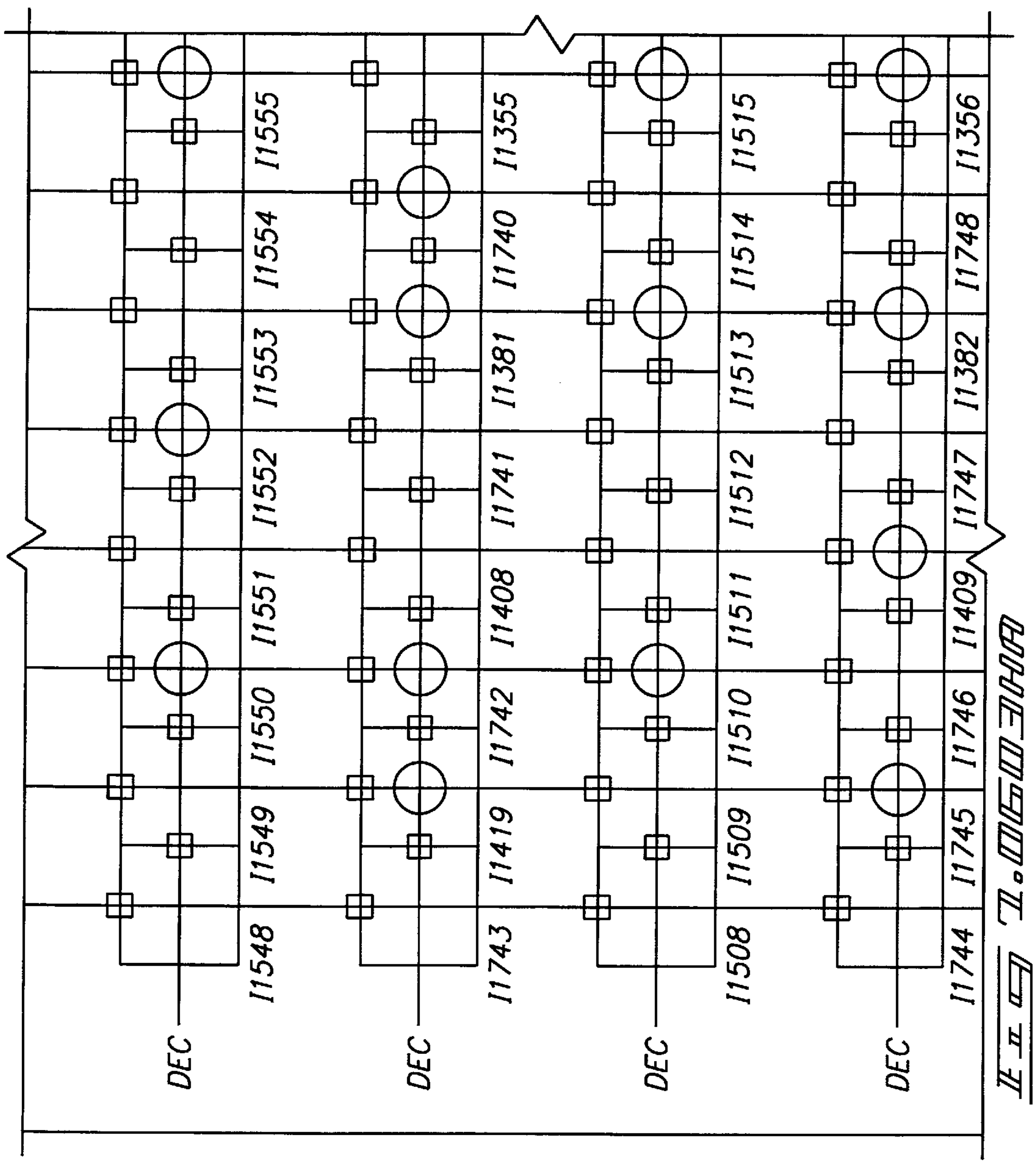
FIG. 7.060EHA

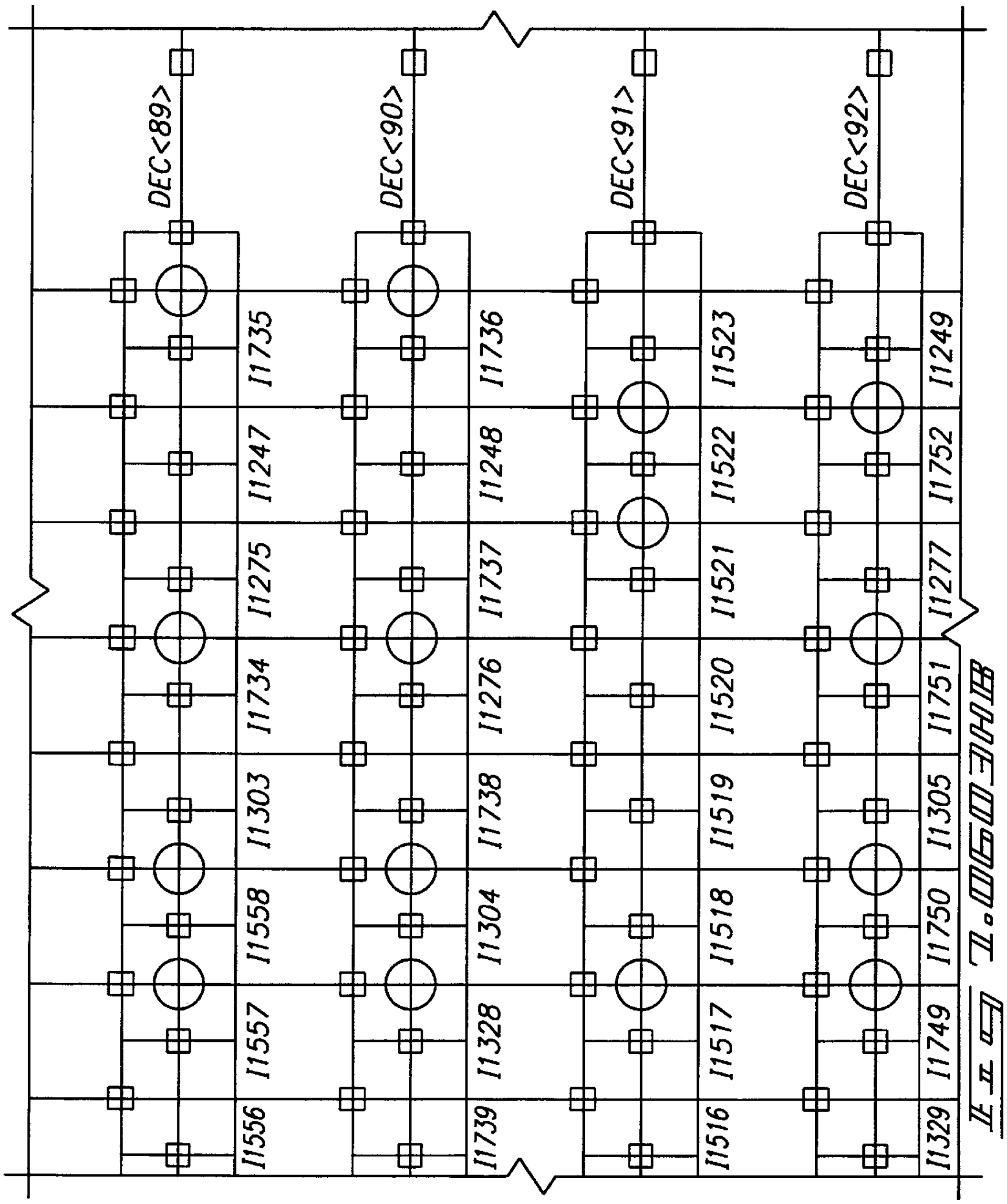
DEC<89>
DEC<90>
DEC<91>
DEC<92>
I1735
I1247
I1275
I1734
I1303
I1558
I1557
I1556
I1736
I1248
I1737
I1276
I1738
I1304
I1328
I1739
I1523
I1522
I1521
I1520
I1519
I1518
I1517
I1516
I1249
I1752
I1277
I1751
I1305
I1750
I1749
I1329

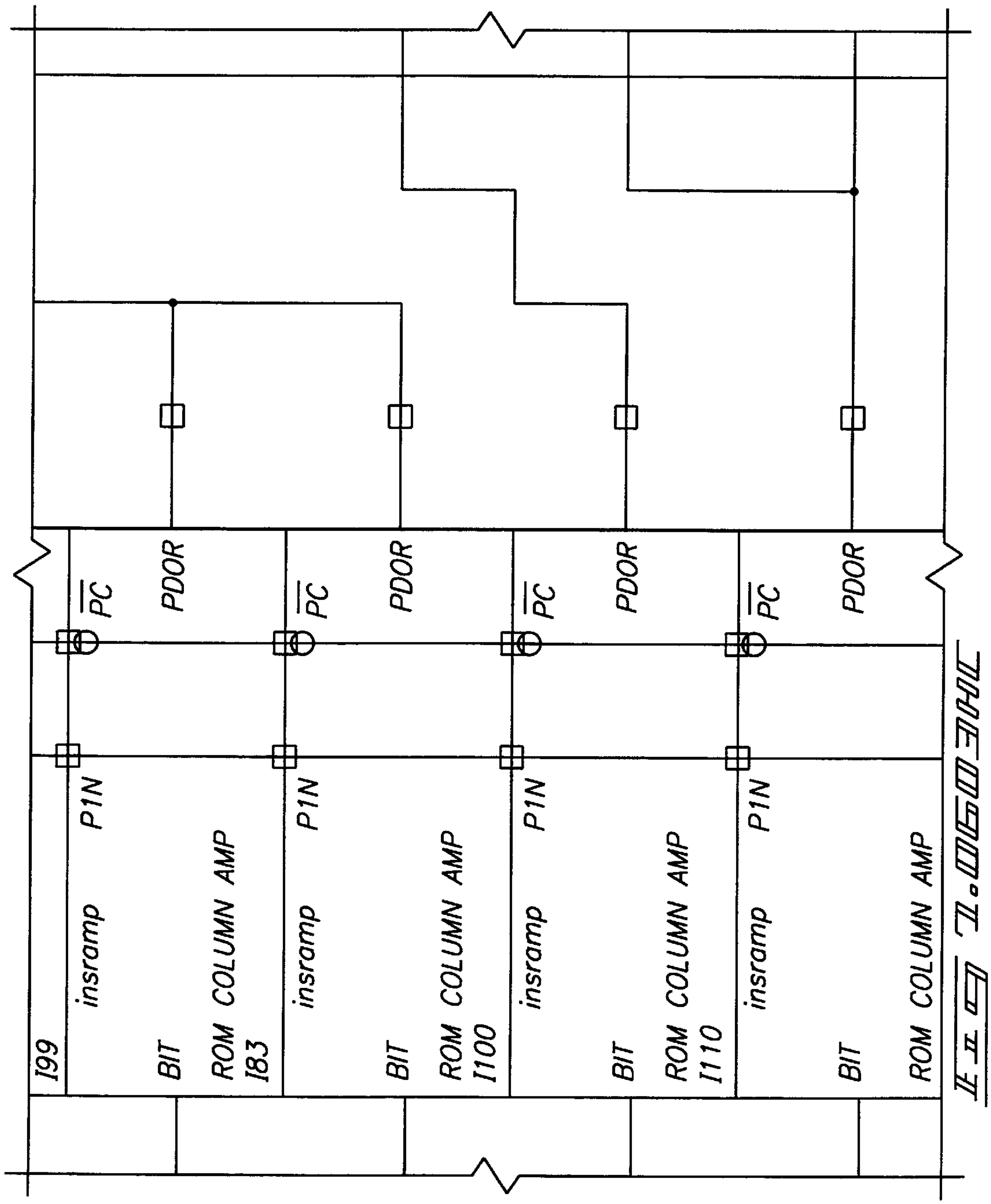
FIG. 7.060EKK

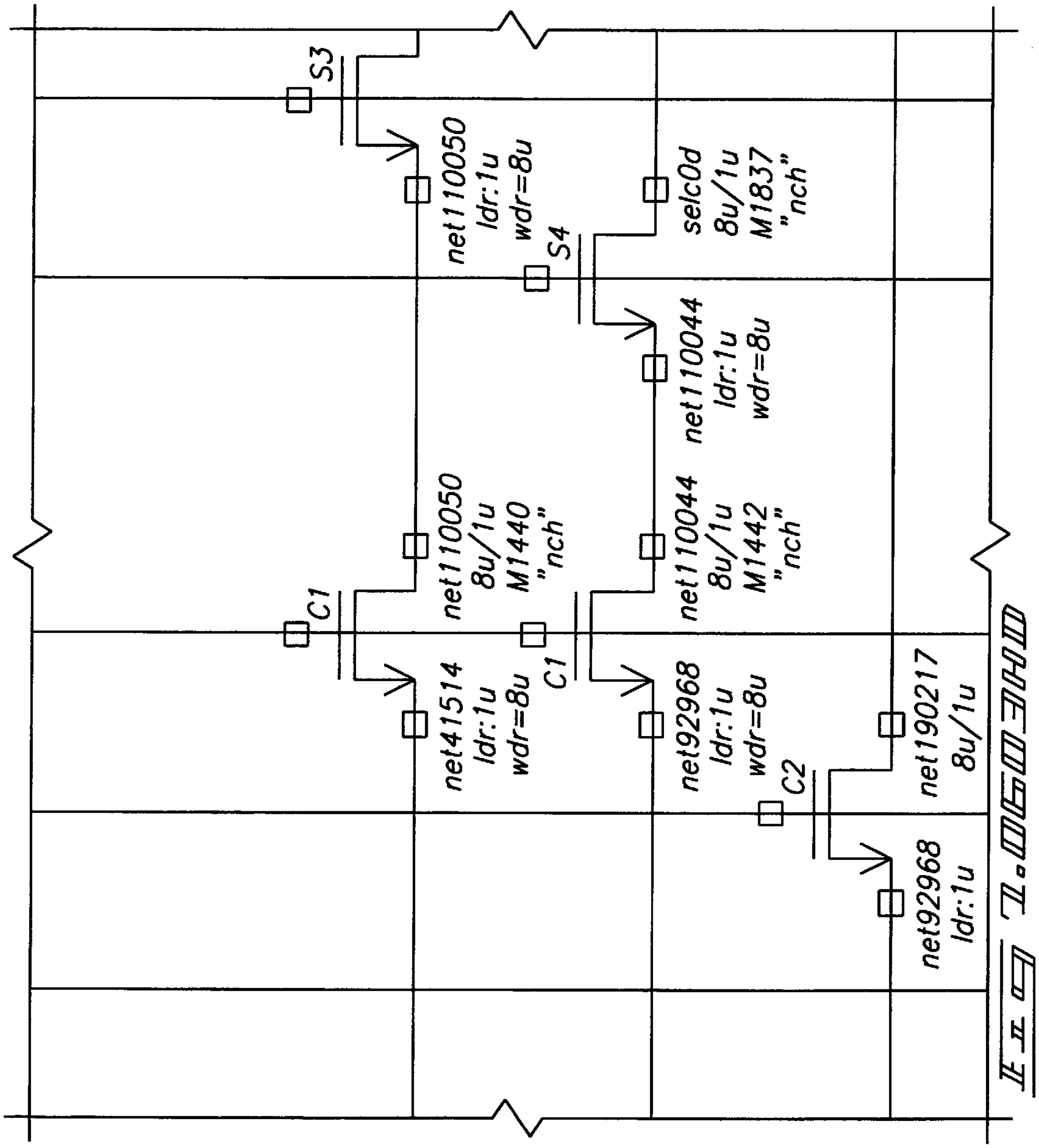
FIG. 7.00503AHD

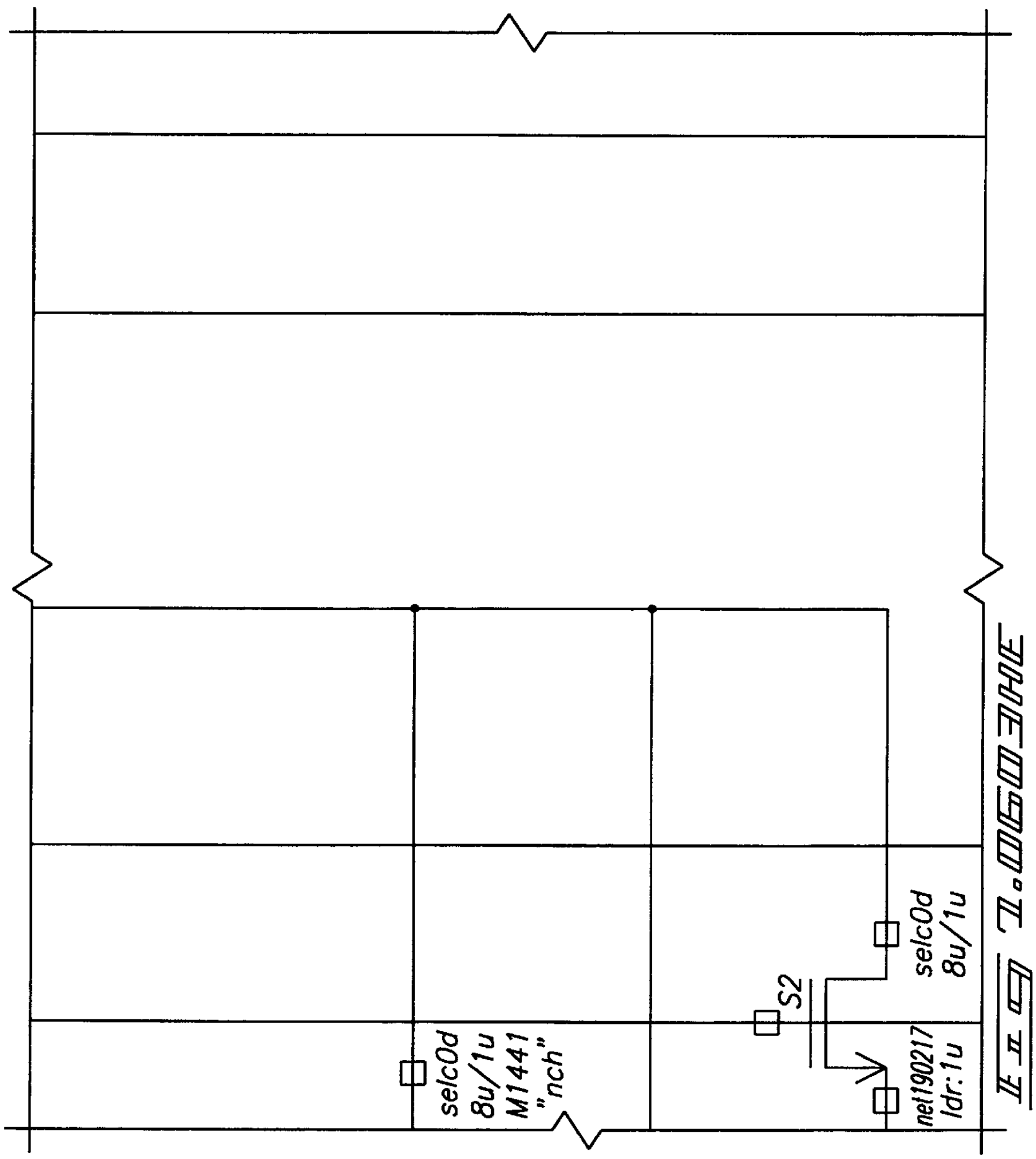
FIG. 1.0603HE

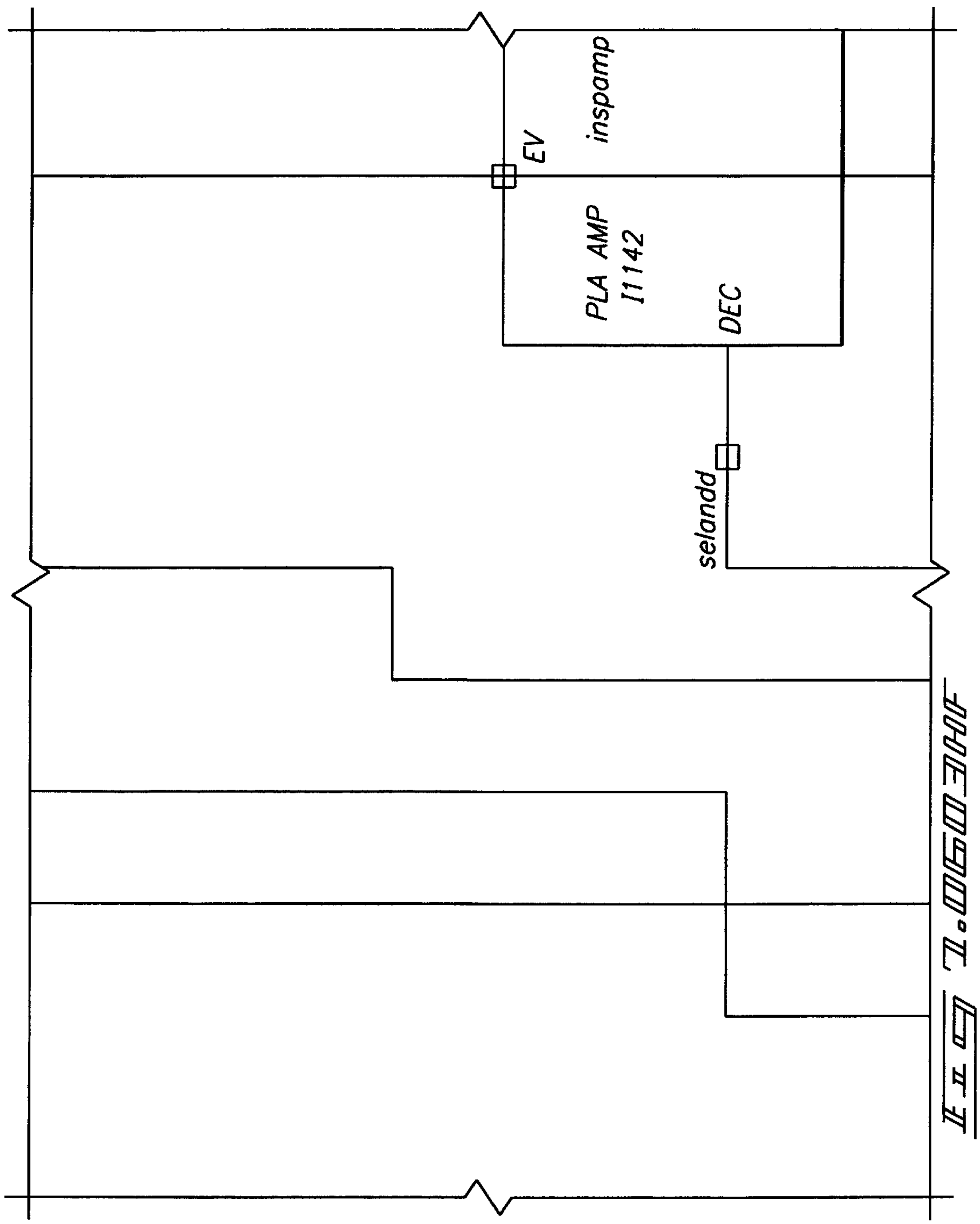
FIG. 7.0690AE

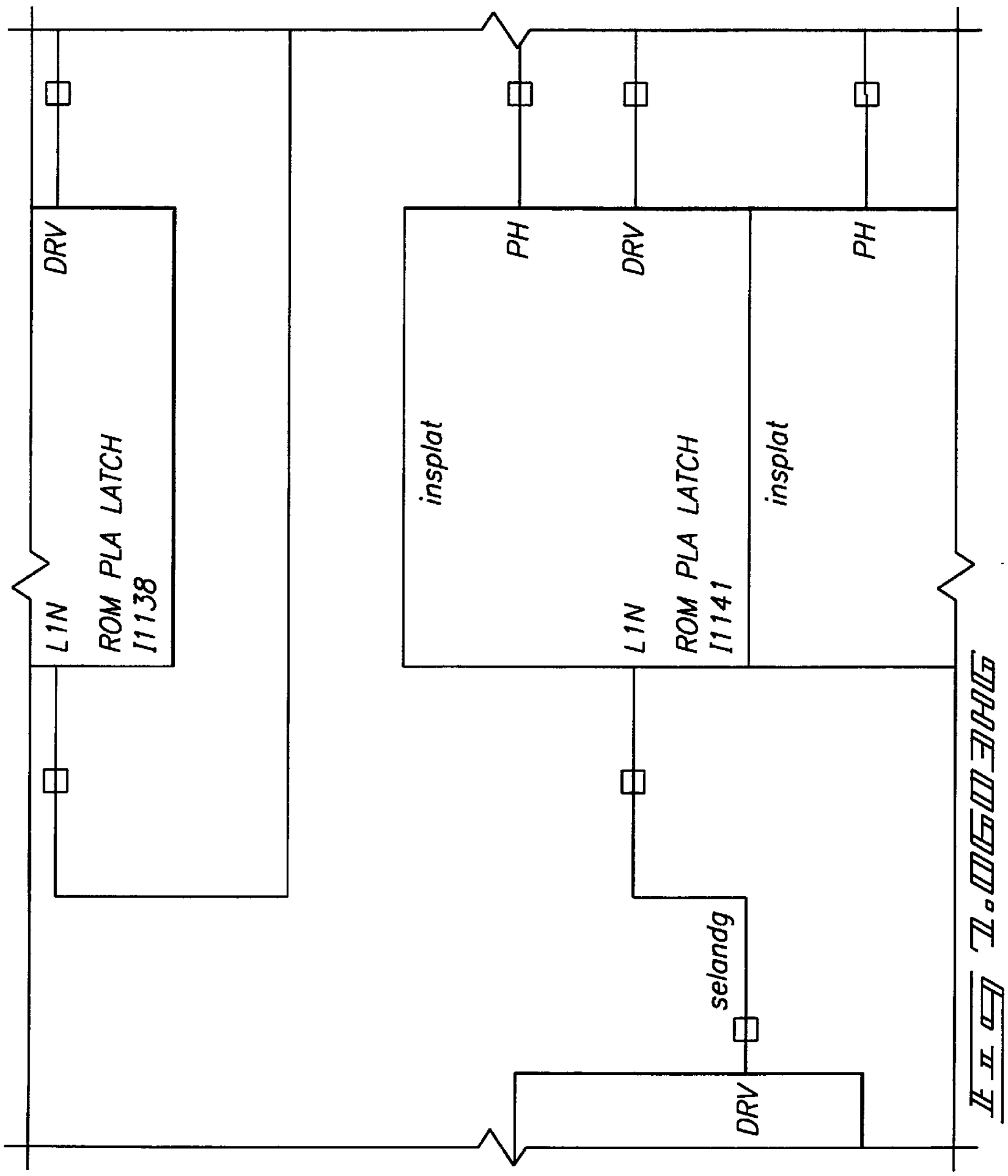
Fig. 7.060EAHG

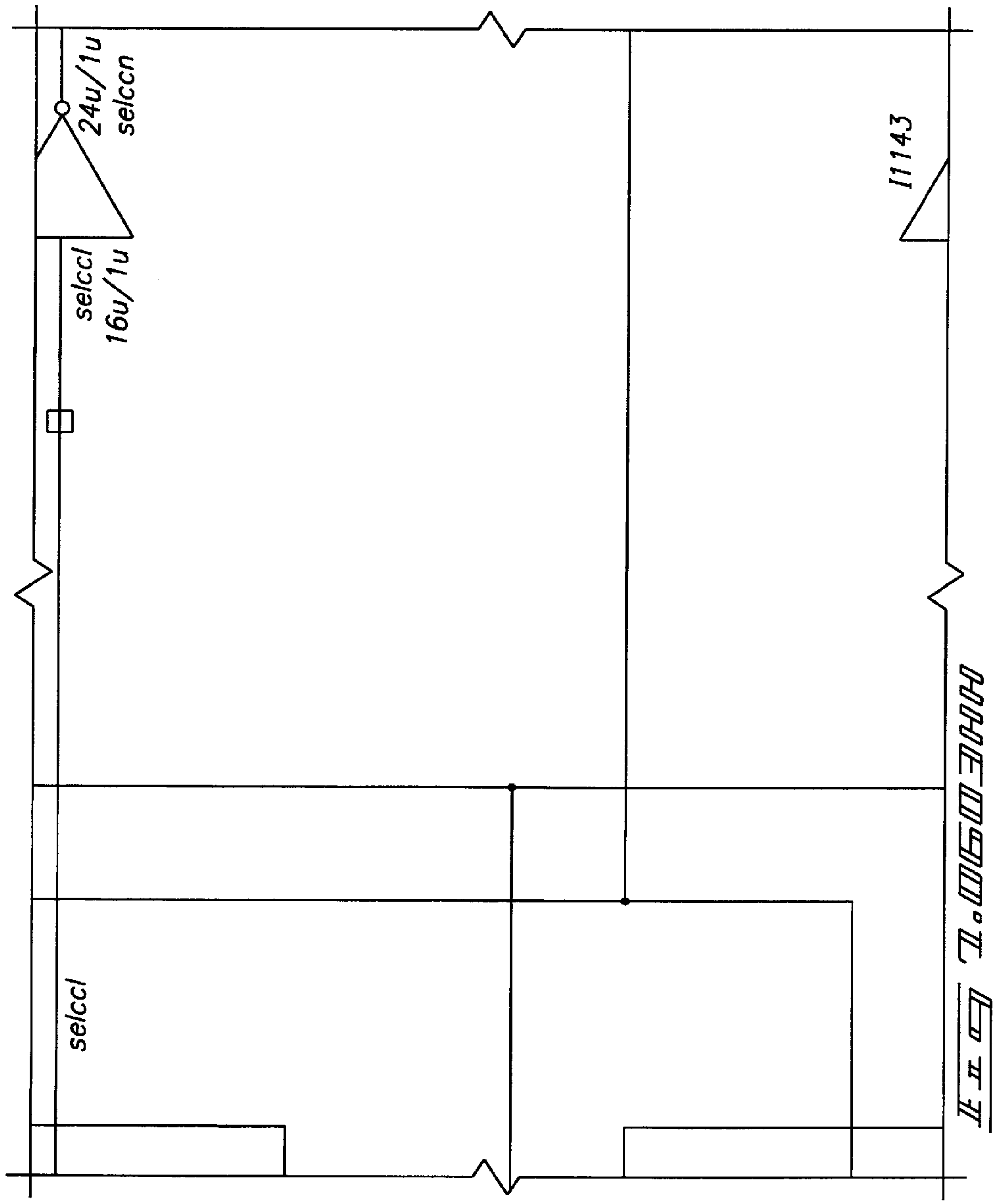
Fig. 7.060EHH

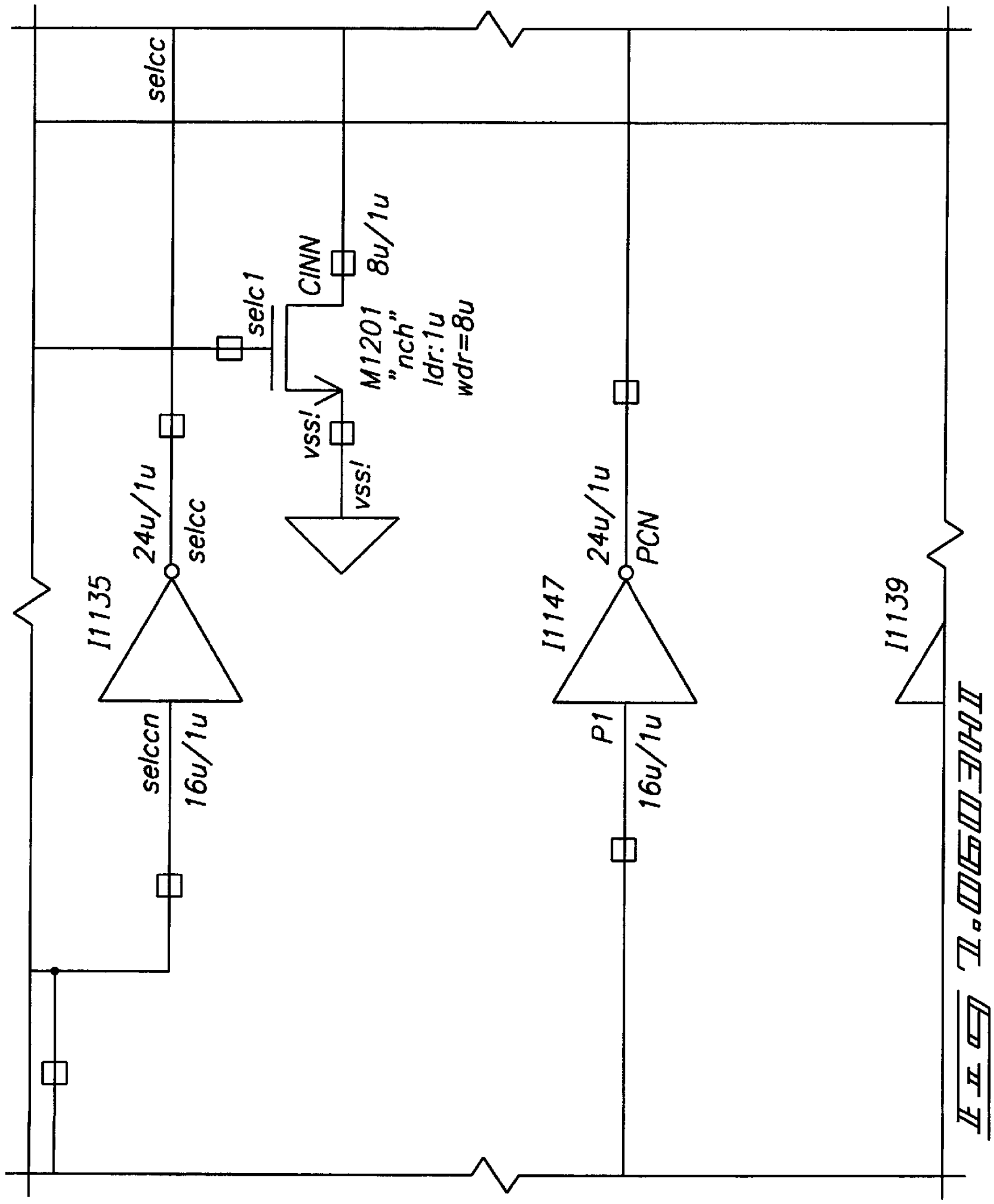
selcc
selc1
CINN
8u/1u
M1201
"nch"
ldr:1u
wdr=8u
vss!
vss!
24u/1u
selcc
I1135
selccn
16u/1u
I1147
24u/1u
PCN
P1
16u/1u
I1139

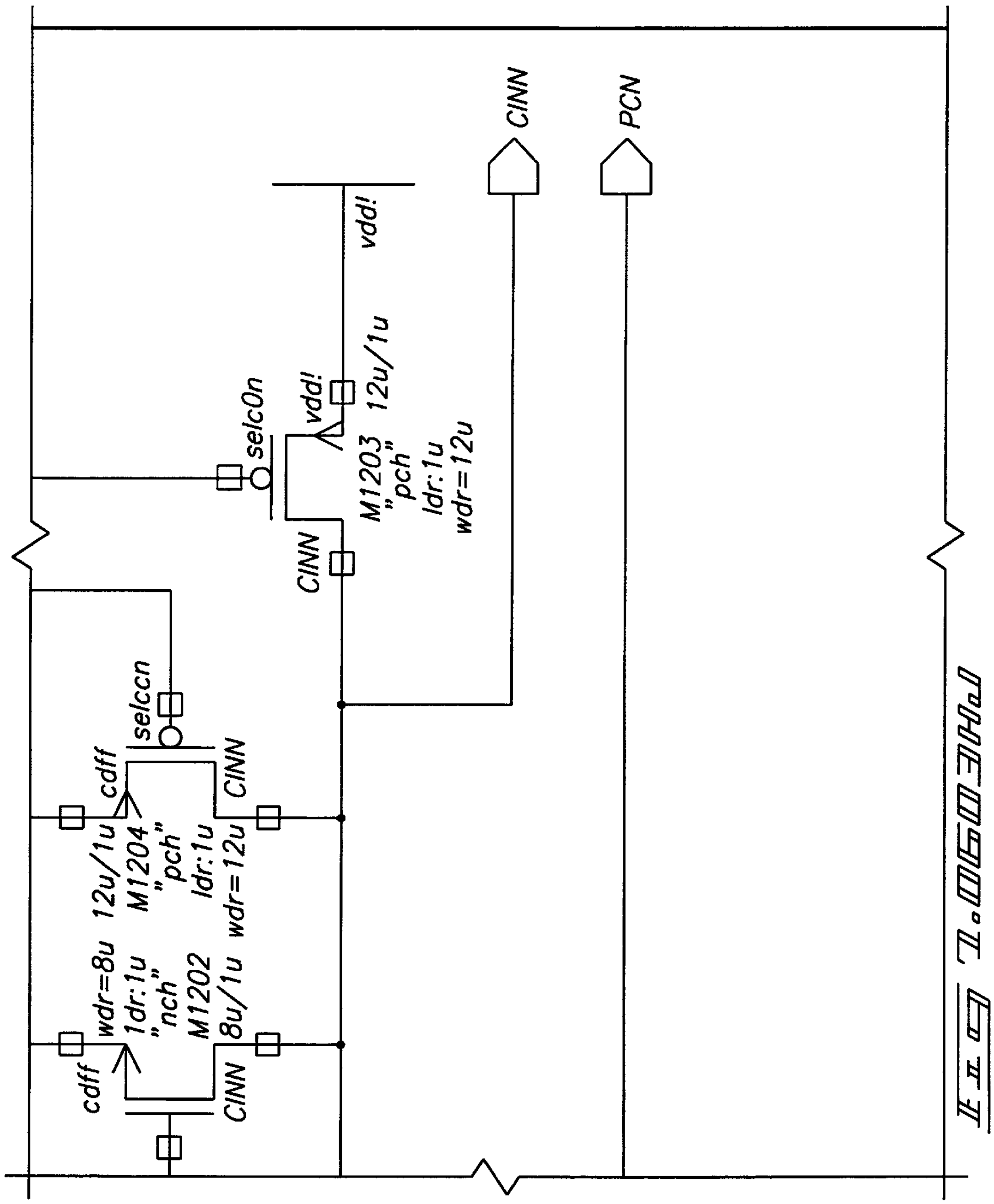
FIG. 7L.0603HJ

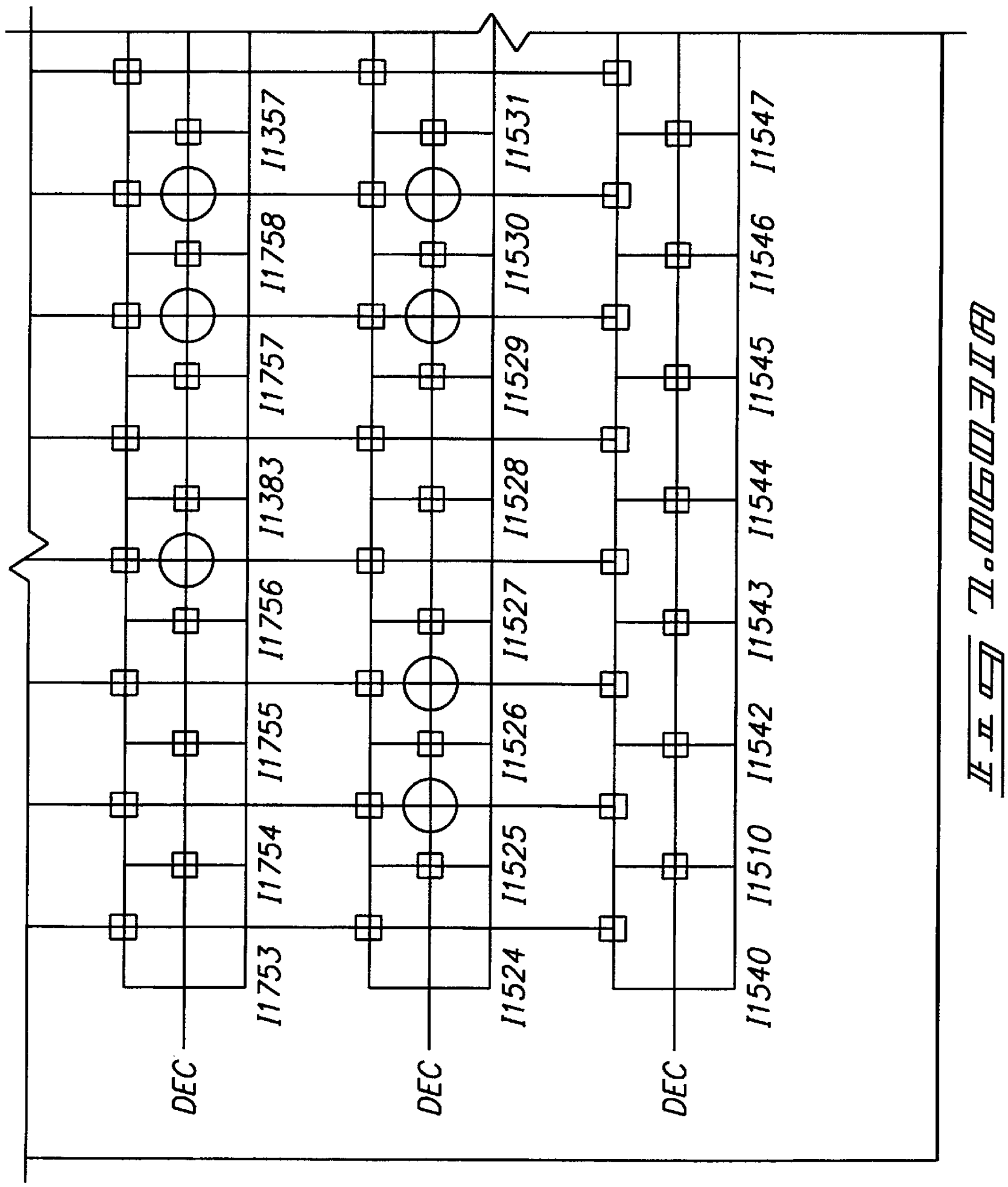
Fig. 7.060E1A

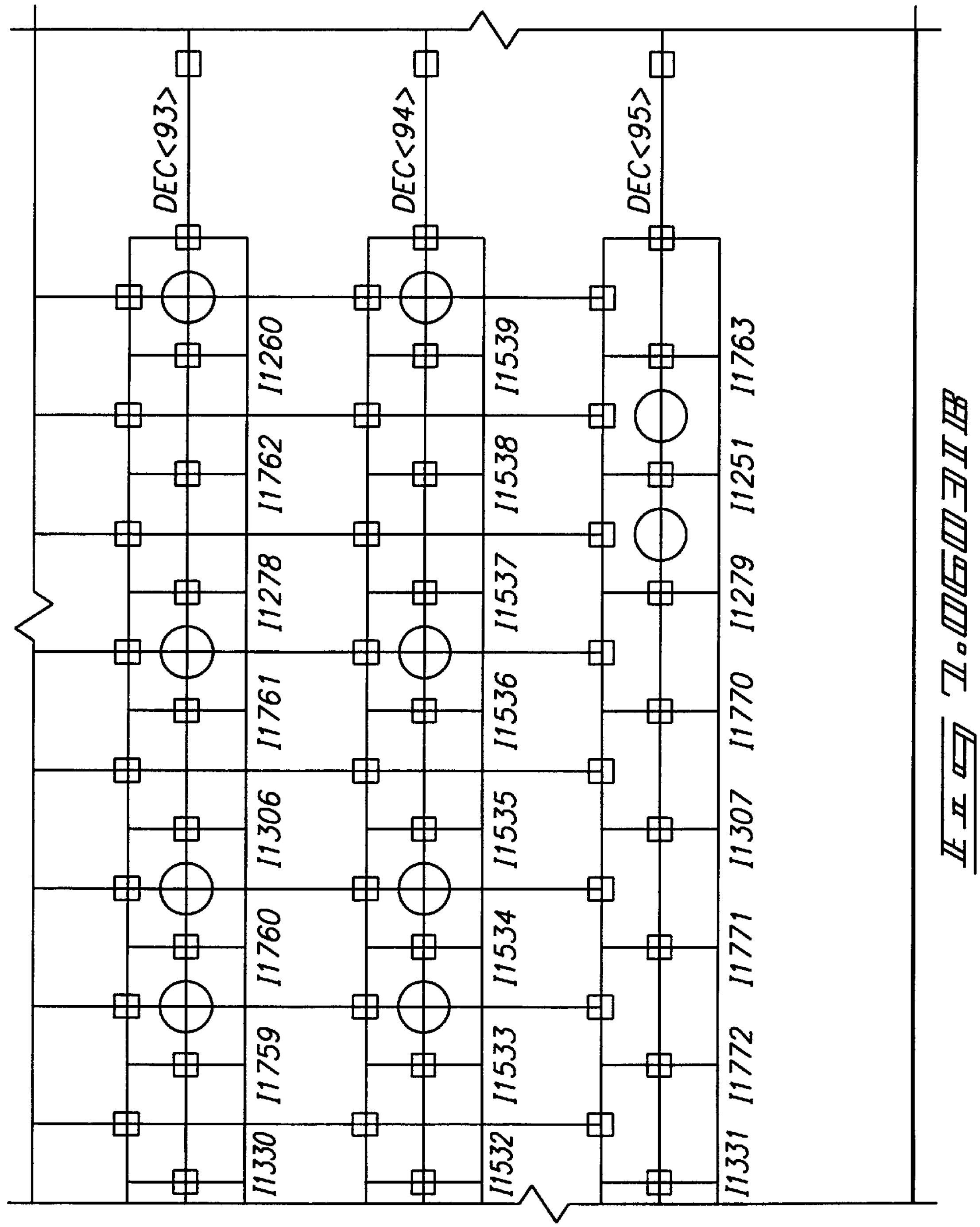
FIG. 7.060E1B

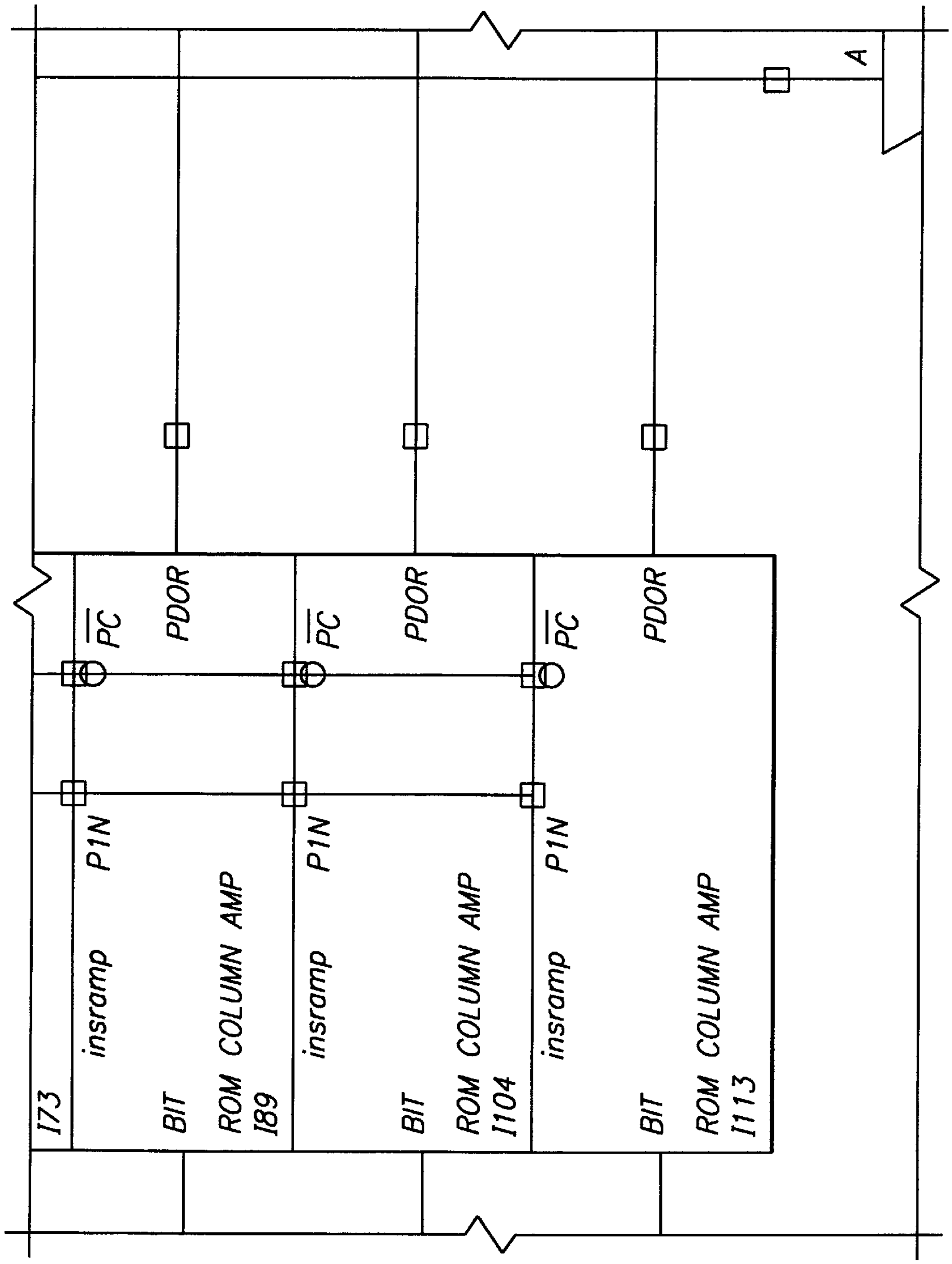
FIG. 7.060311C

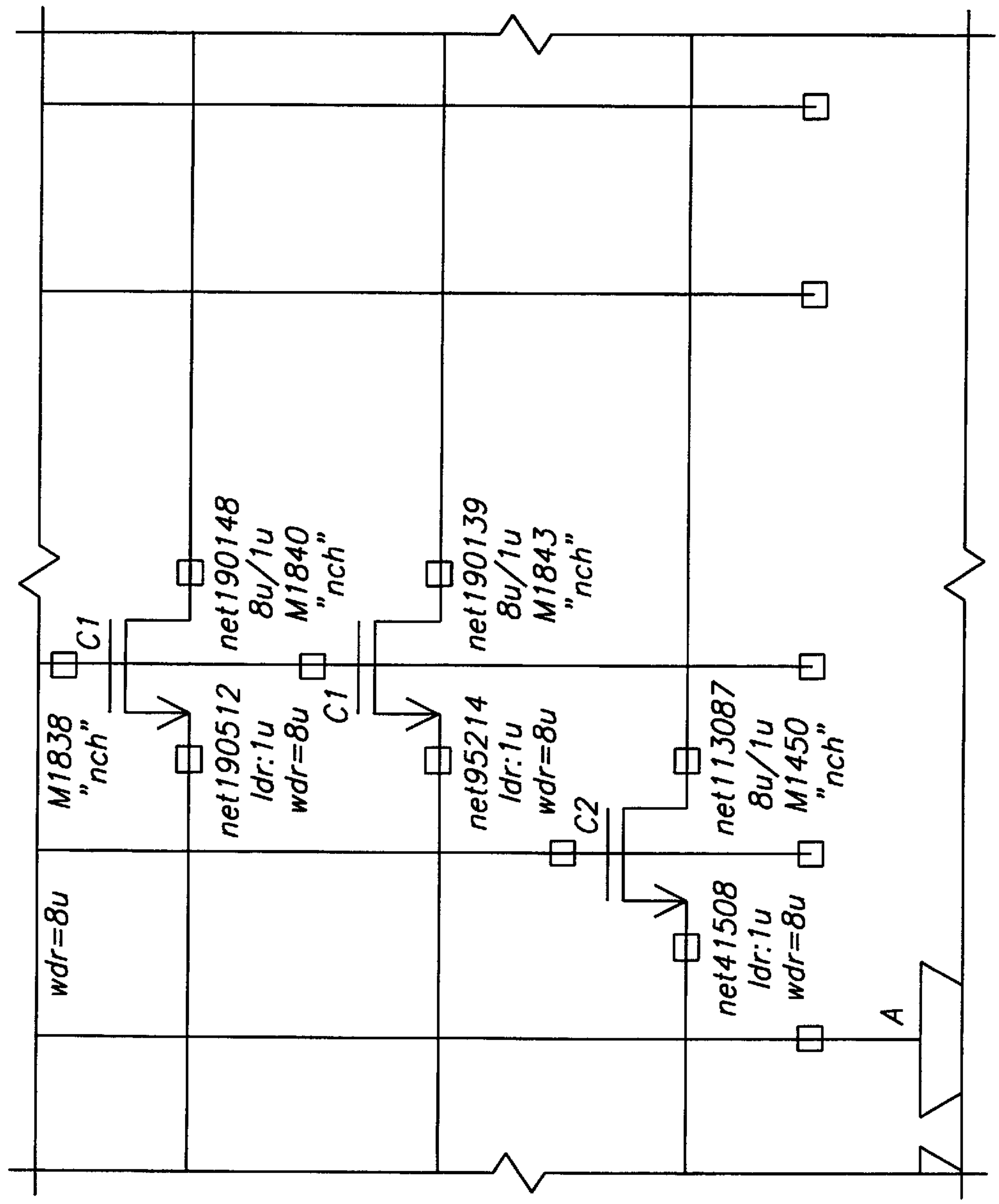
Fig. 7.090E1D

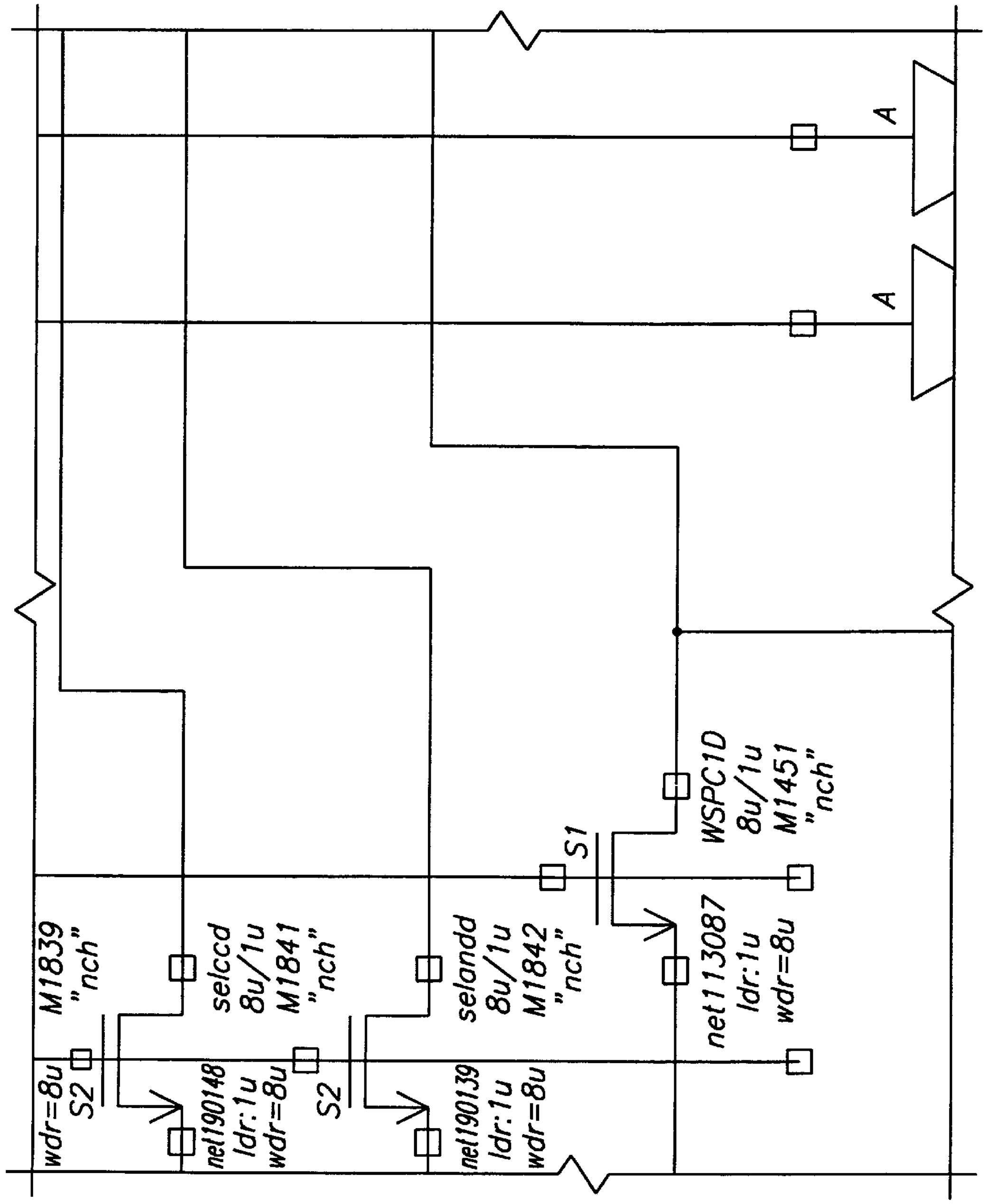
FIG. 7.06G03IE

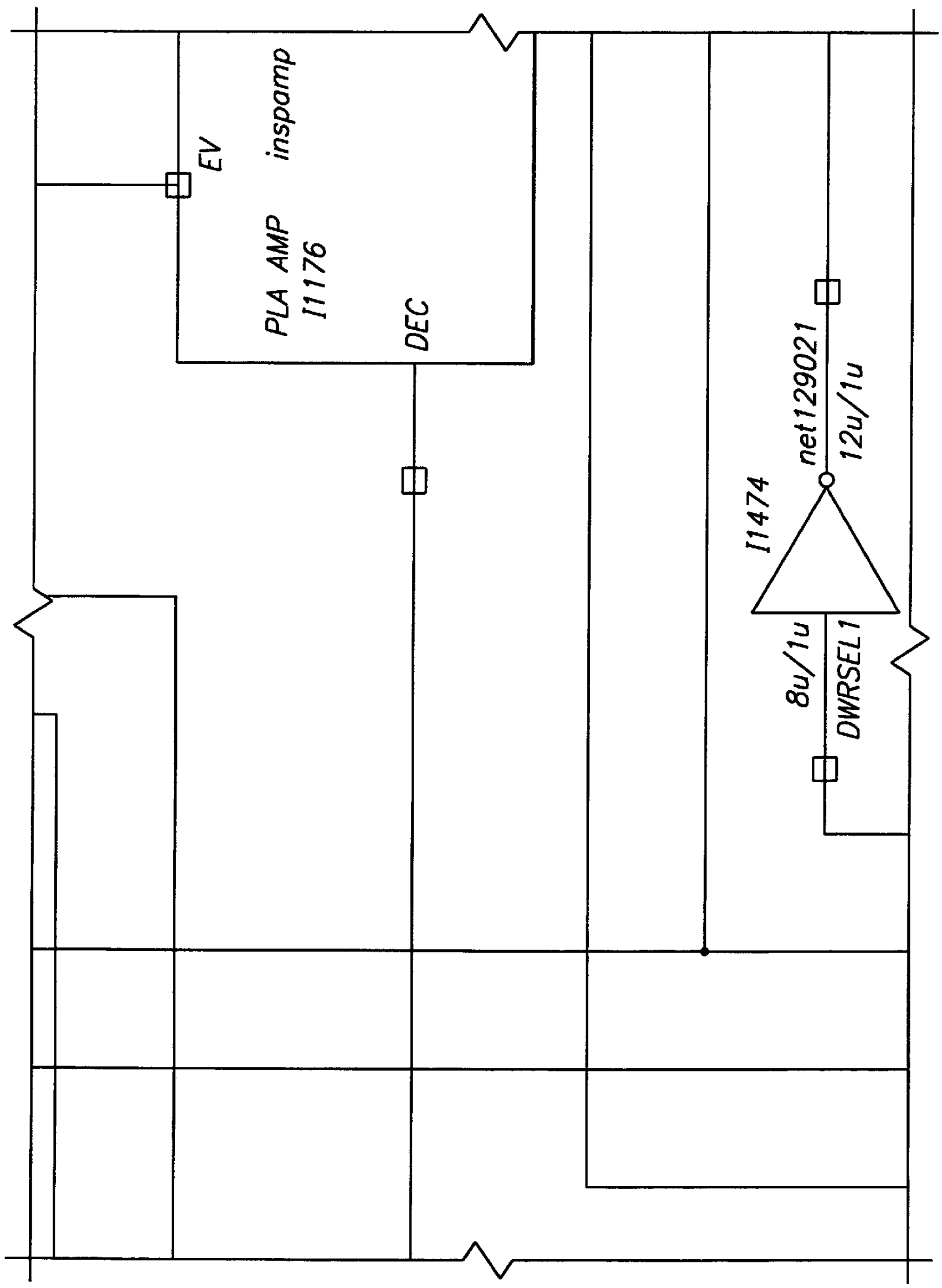
FIG. 7.060EIF

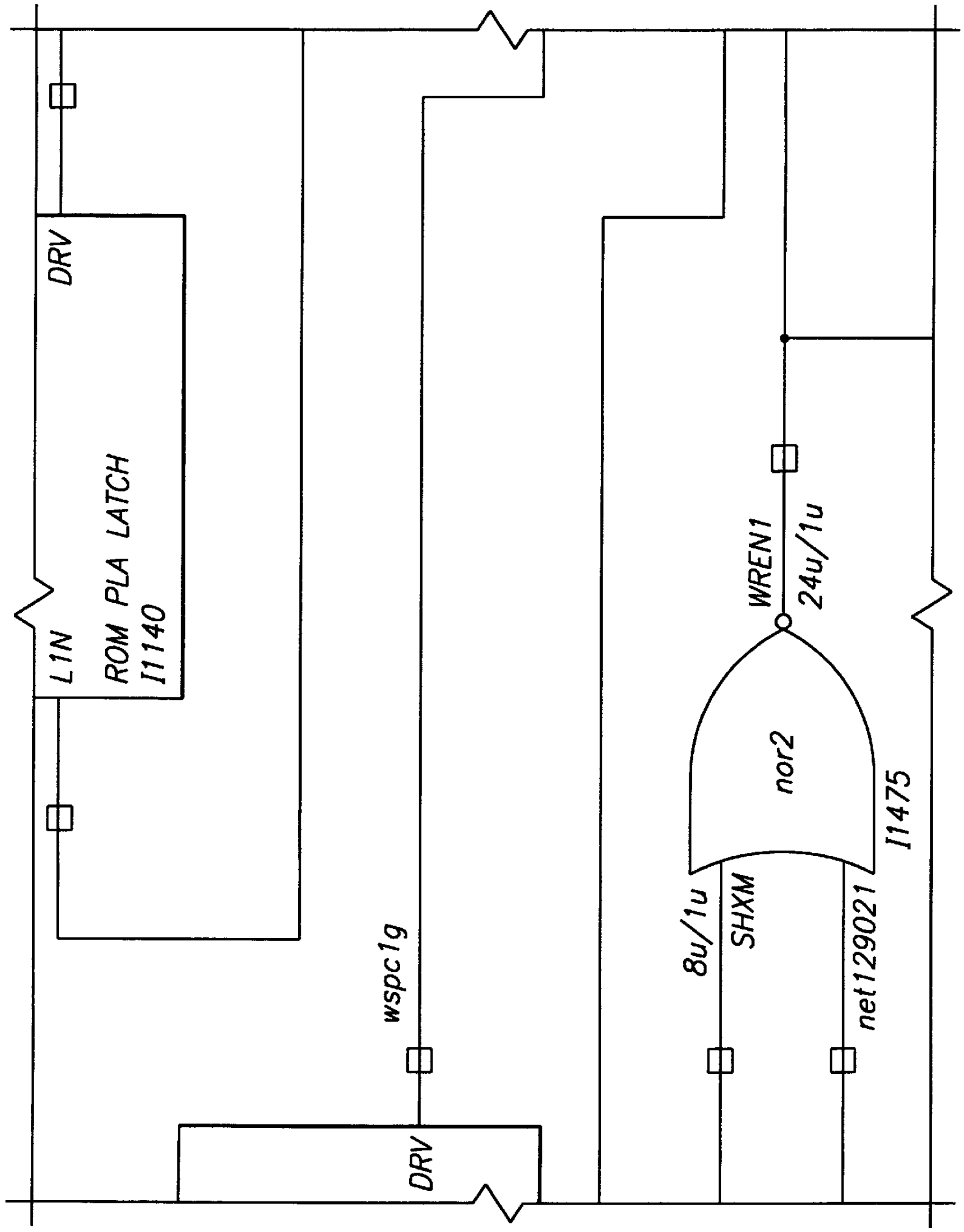
FIG. 7.060EIG

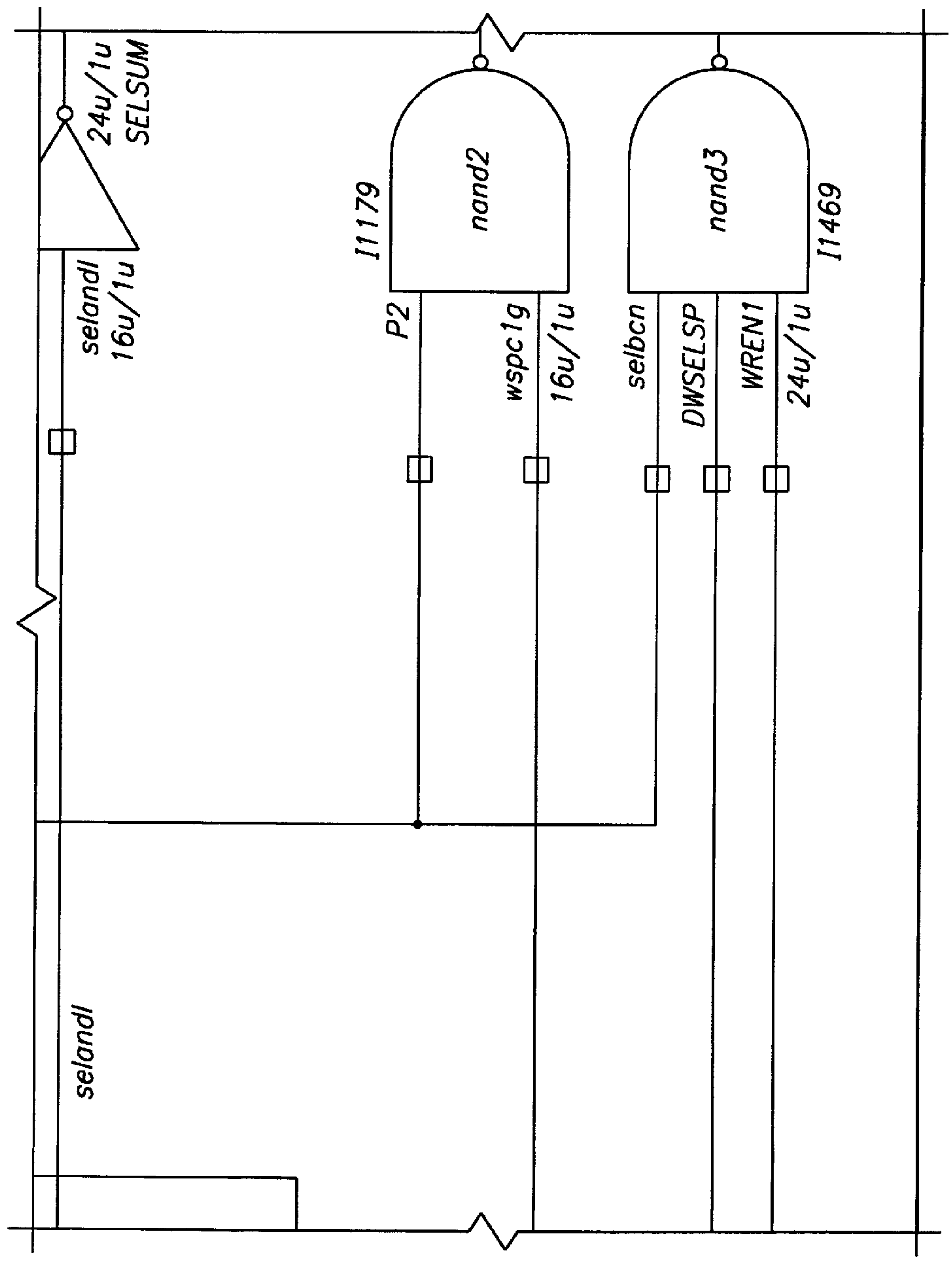
Fig. 7.0090EH

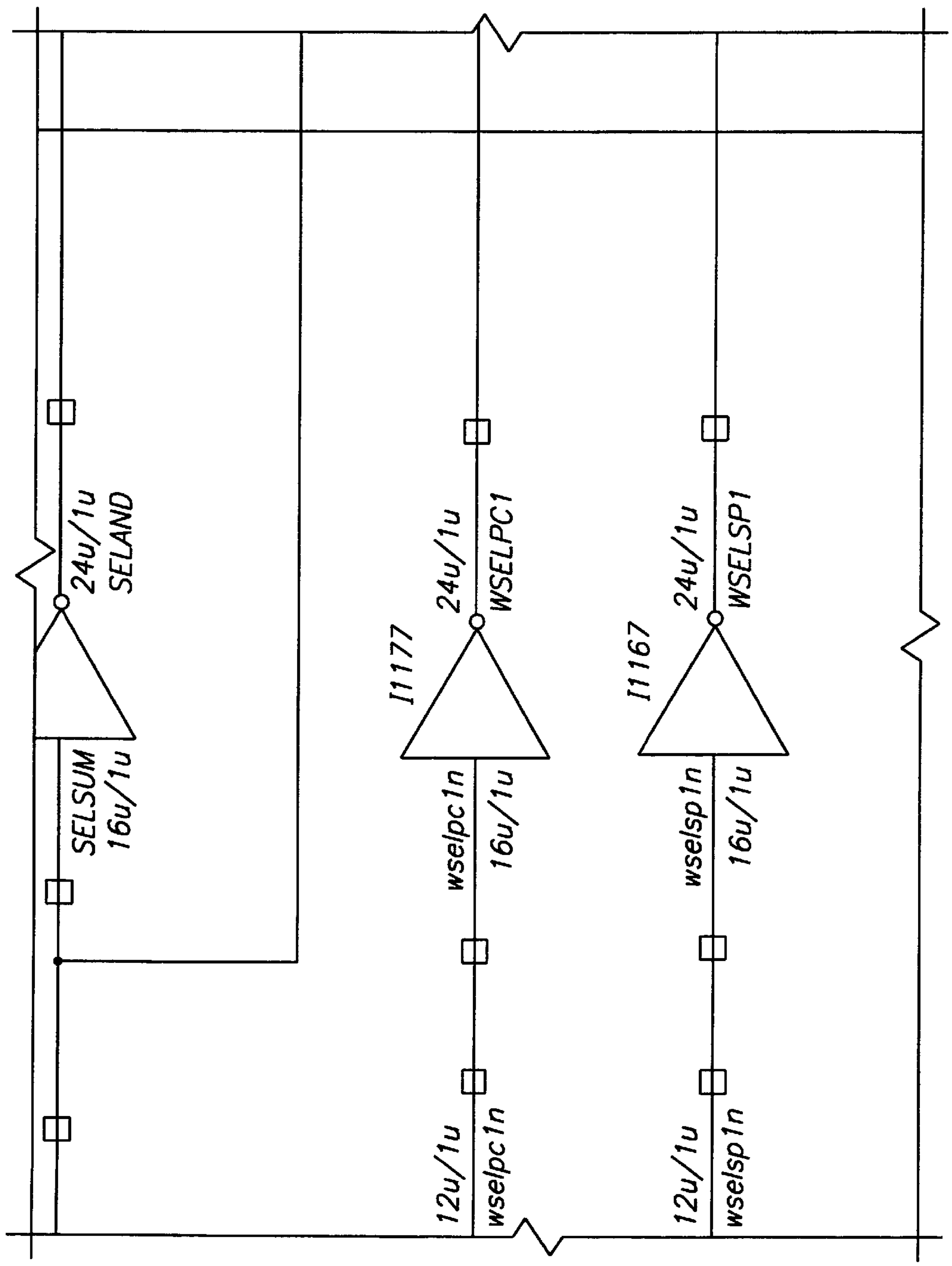
Fig. 7.090EII

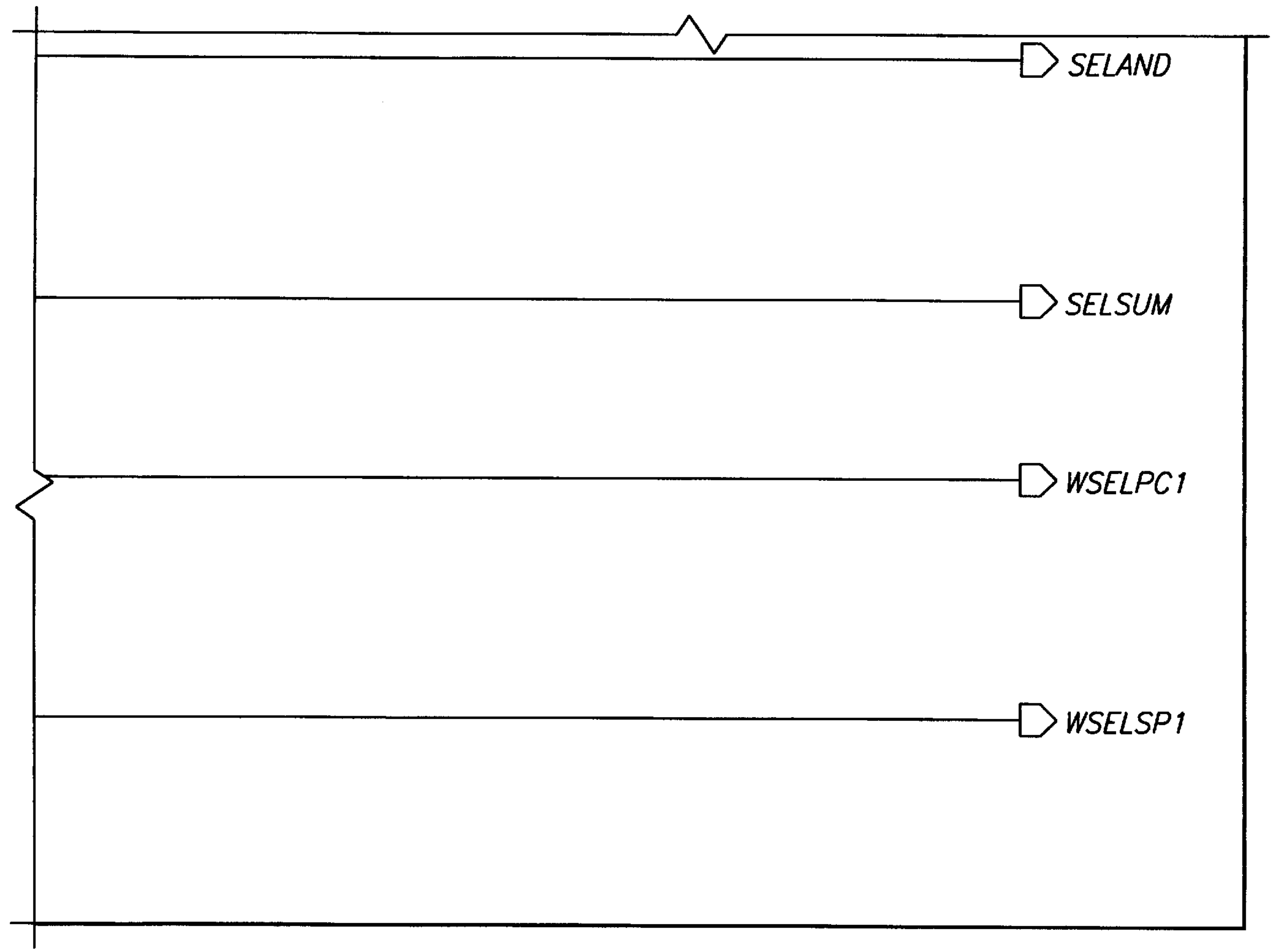
FIG. 7.0603IJ

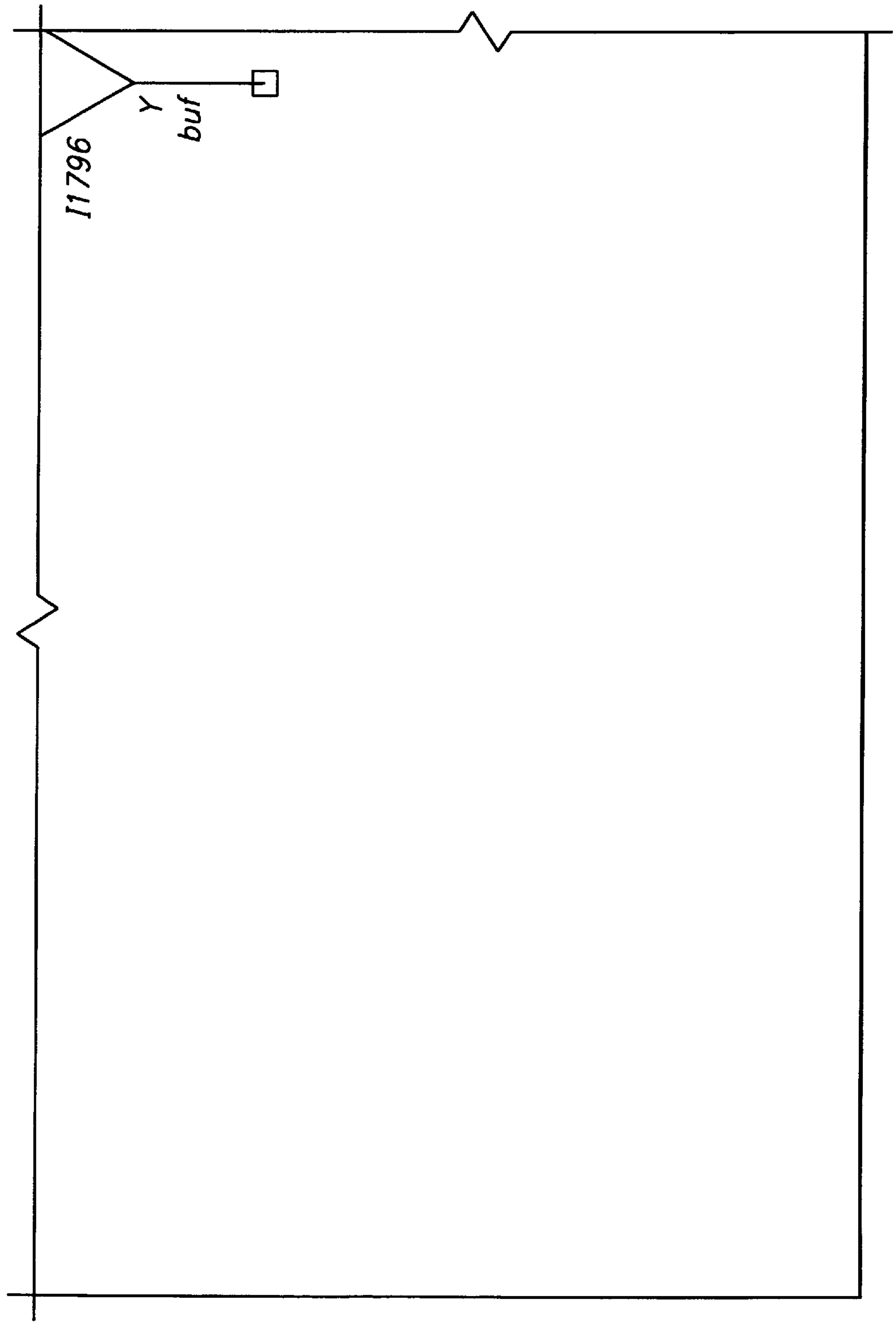
FIG. 7.0690EAE

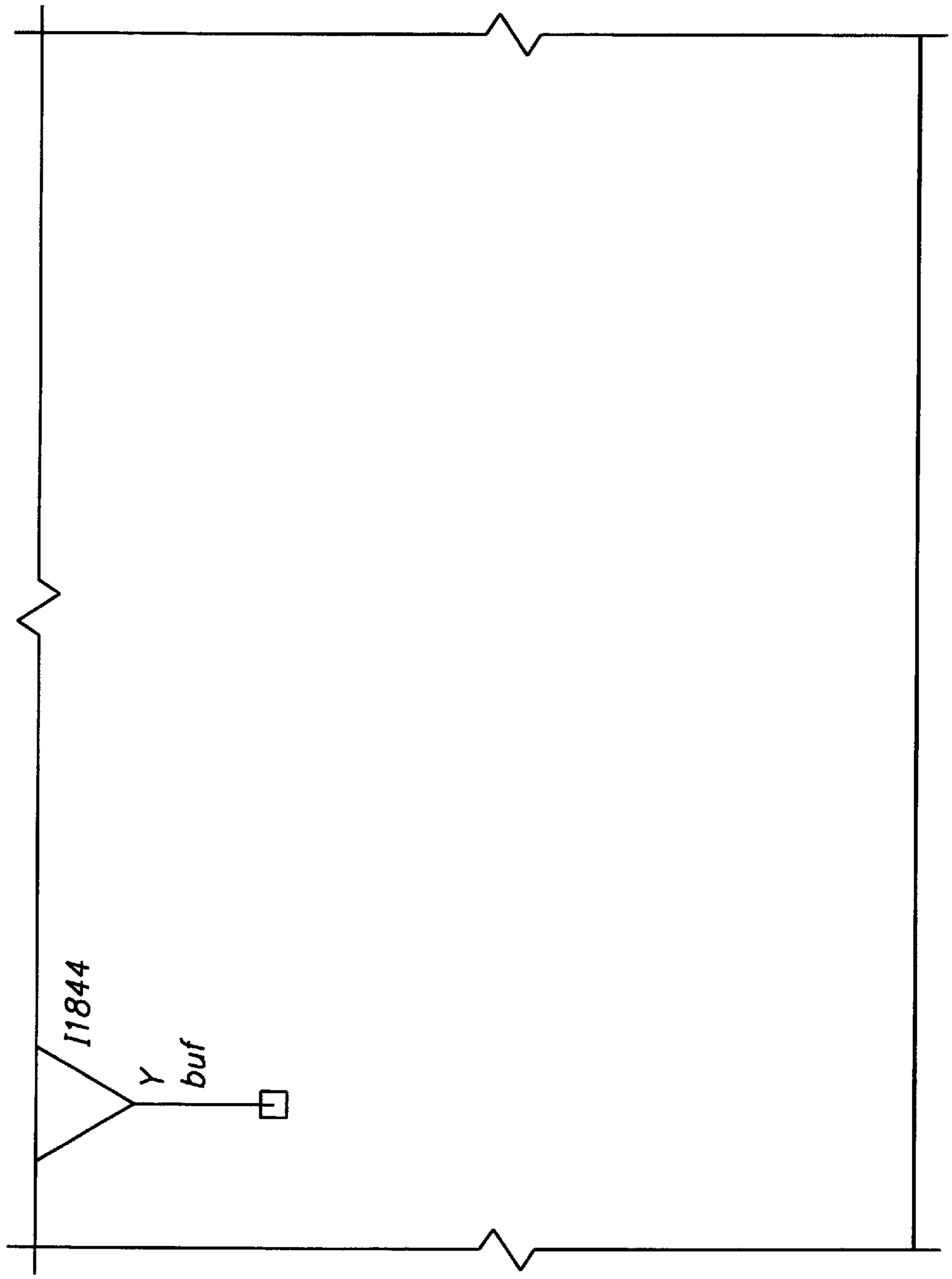
Fig. 7.0603JD

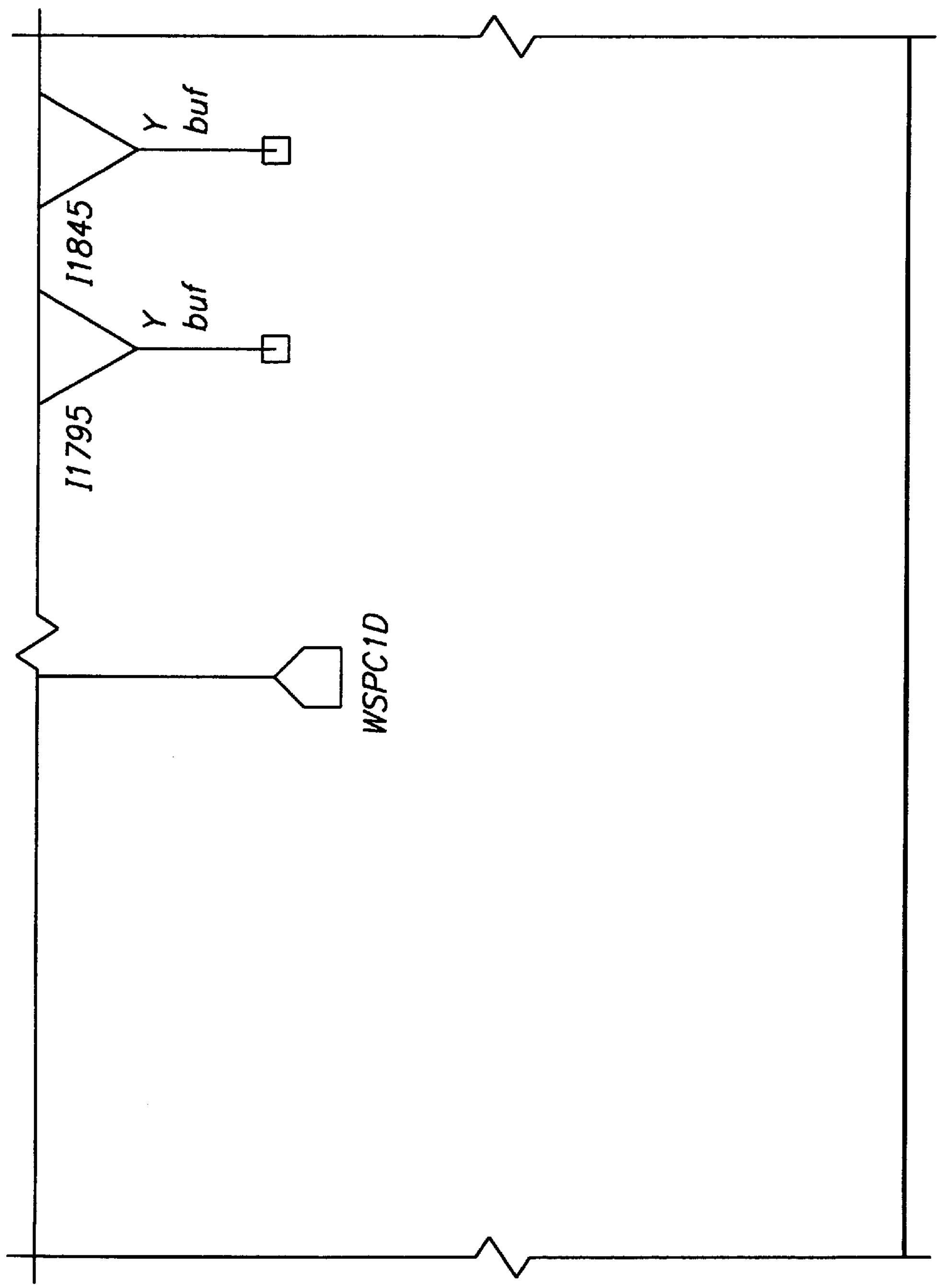
FIG. 7.0603AE

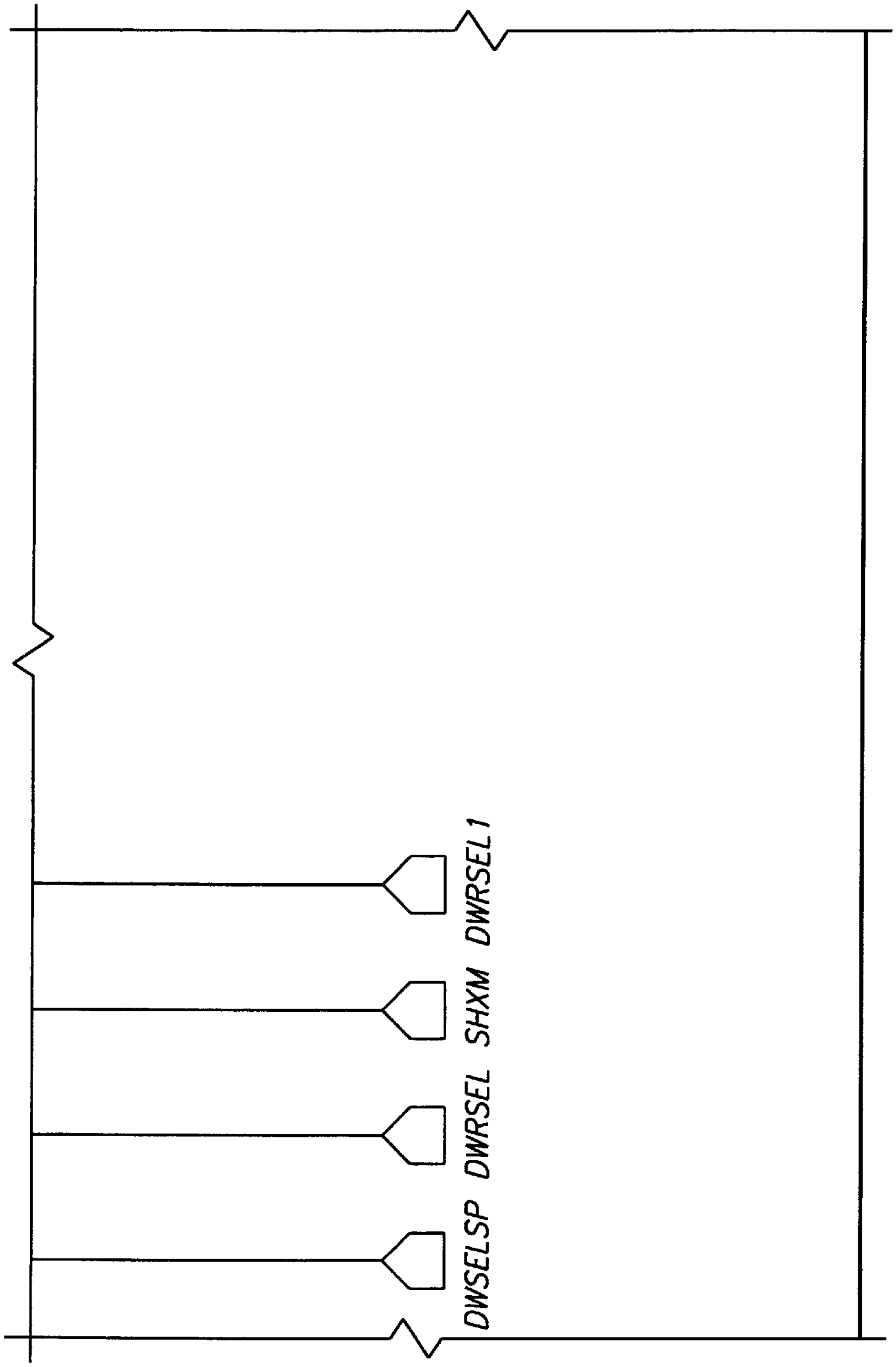
FIG. 7.0603F

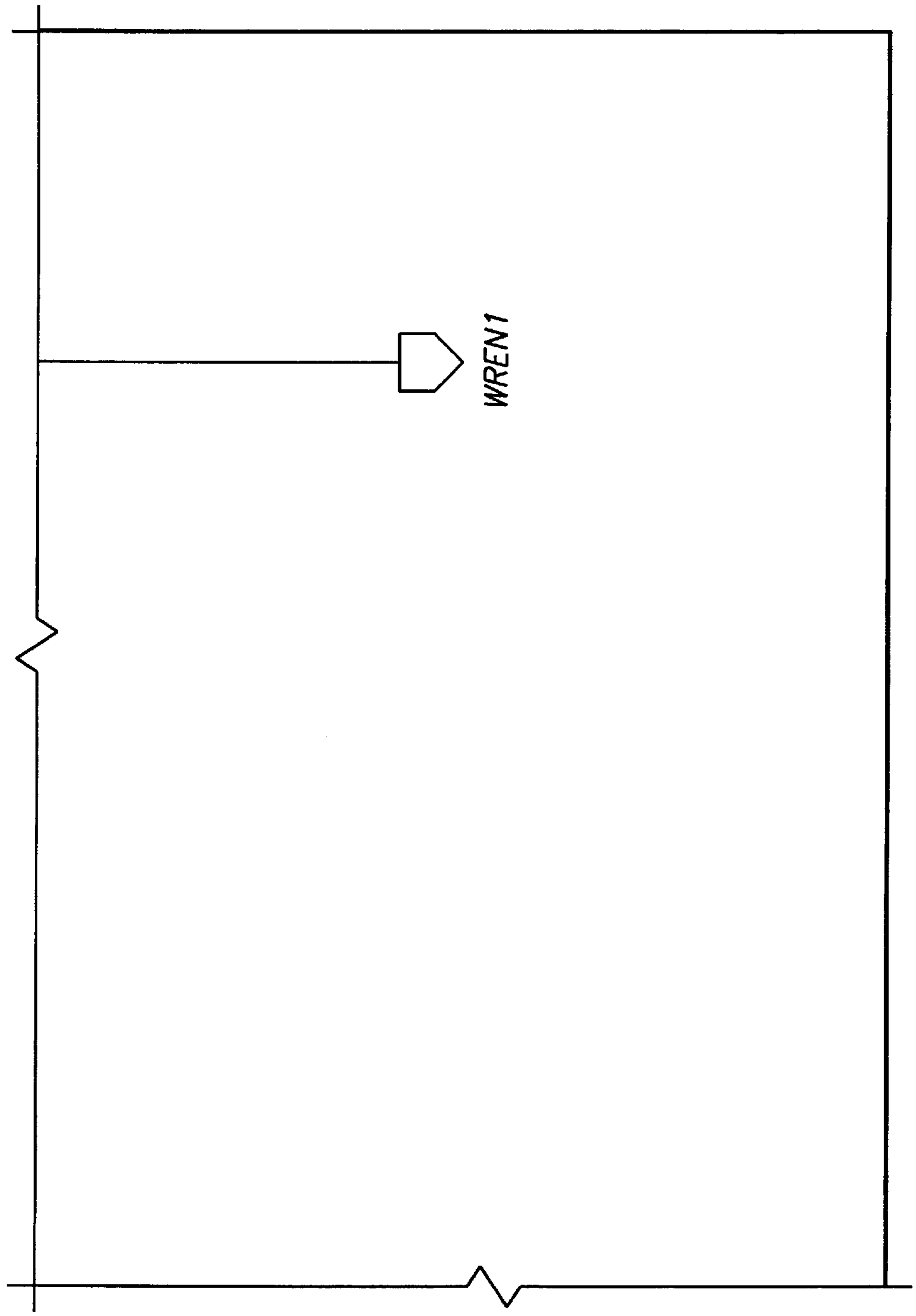
FIG. 7.0603JG

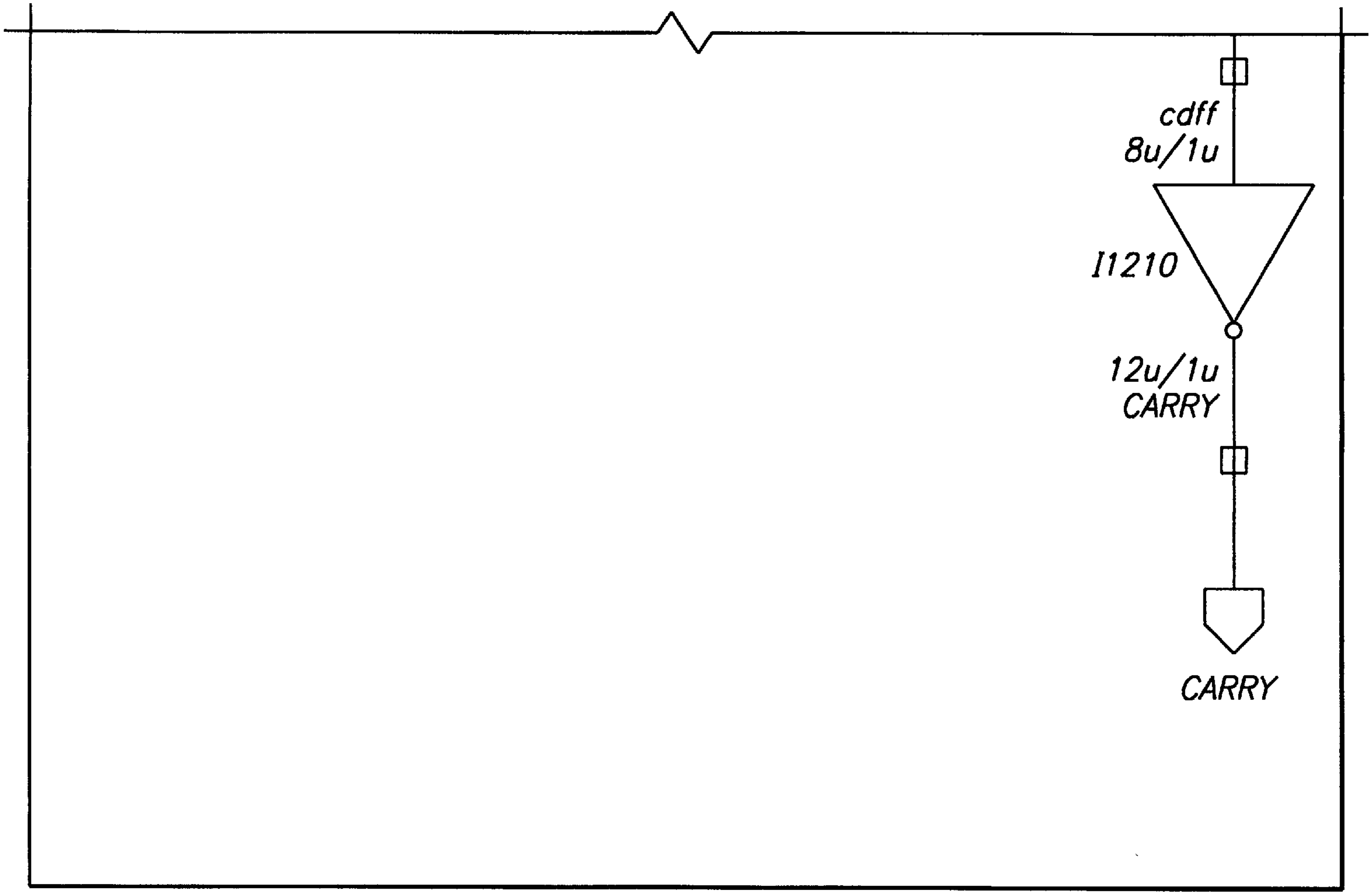
FIG. 7.0603.II

| | | | | | | | | |
|---|---|---|---|---|---|---|---|---|
| 7.0604AA | 7.0604AB | 7.0604AC | 7.0604AD | 7.0604AE | 7.0604AF | 7.0604AG | 7.0604AH | 7.0604AI |
| 7.0604BA | 7.0604BB | 7.0604BC | 7.0604BD | 7.0604BE | 7.0604BF | 7.0604BG | 7.0604BH | 7.0604BI |
| 7.0604CA | 7.0604CB | 7.0604CC | 7.0604CD | 7.0604CE | 7.0604CF | 7.0604CG | 7.0604CH | 7.0604CI |
| 7.0604DA | 7.0604DB | 7.0604DC | 7.0604DD | 7.0604DE | 7.0604DF | 7.0604DG | 7.0604DH | 7.0604DI |
| 7.0604EA | 7.0604EB | 7.0604EC | 7.0604ED | 7.0604EE | 7.0604EF | 7.0604EG | 7.0604EH | |
| 7.0604FA | 7.0604FB | 7.0604FC | 7.0604FD | 7.0604FE | 7.0604FF | 7.0604FG | 7.0604FH | 7.0604FI |
| 7.0604GA | 7.0604GB | 7.0604GC | 7.0604GD | 7.0604GE | 7.0604GF | 7.0604GG | 7.0604GH | 7.0604GI |
| 7.0604HA | 7.0604HB | 7.0604HC | 7.0604HD | 7.0604HE | 7.0604HF | 7.0604HG | | |
| 7.0604IA | 7.0604IB | 7.0604IC | 7.0604ID | 7.0604IE | 7.0604IF | 7.0604IG | | |
| 7.0604JA | 7.0604JB | 7.0604JC | 7.0604JD | 7.0604JE | 7.0604JF | 7.0604JG | 7.0604JH | 7.0604JI |

Fig. 7.0604

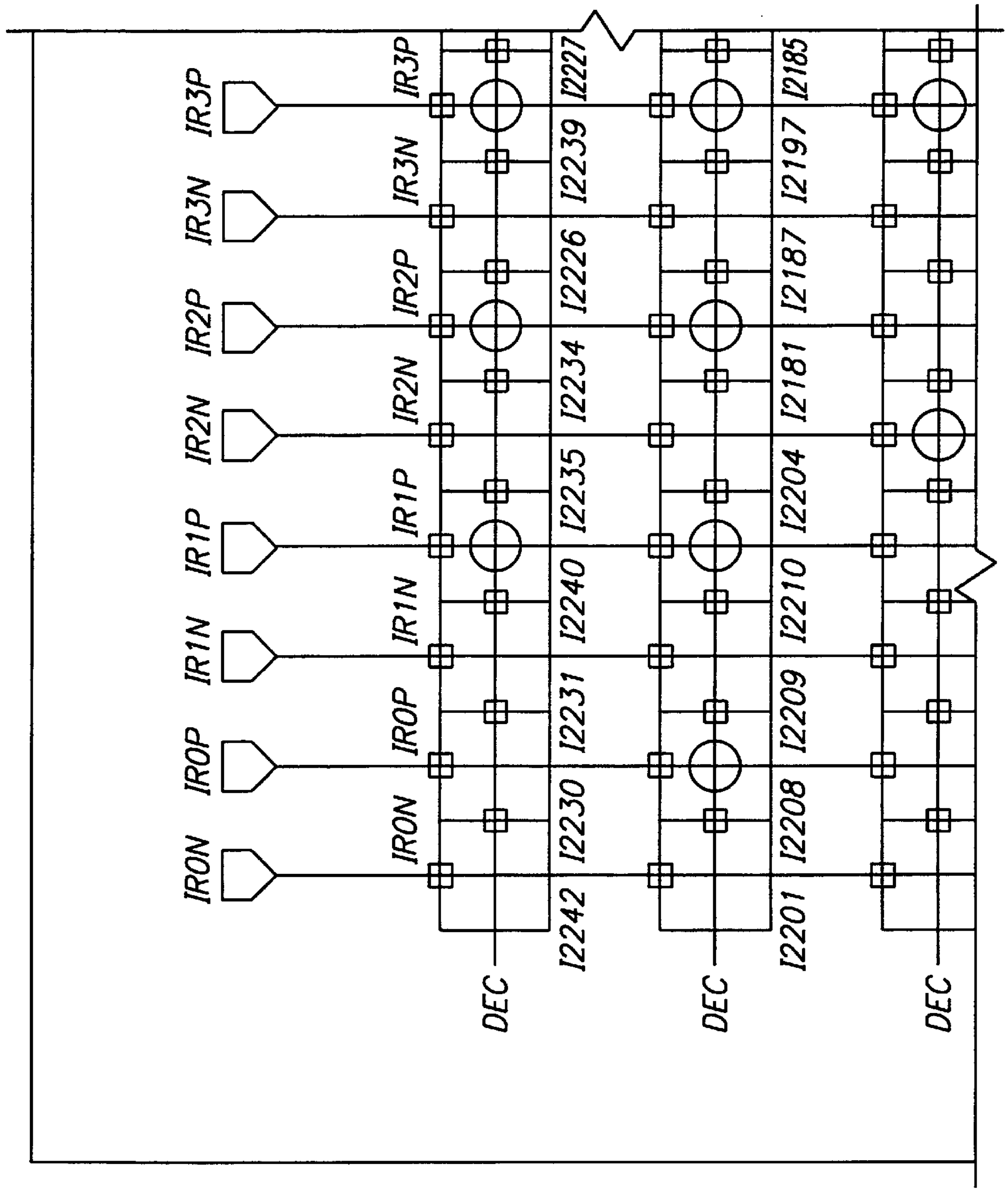
FIG. 7.0604AA

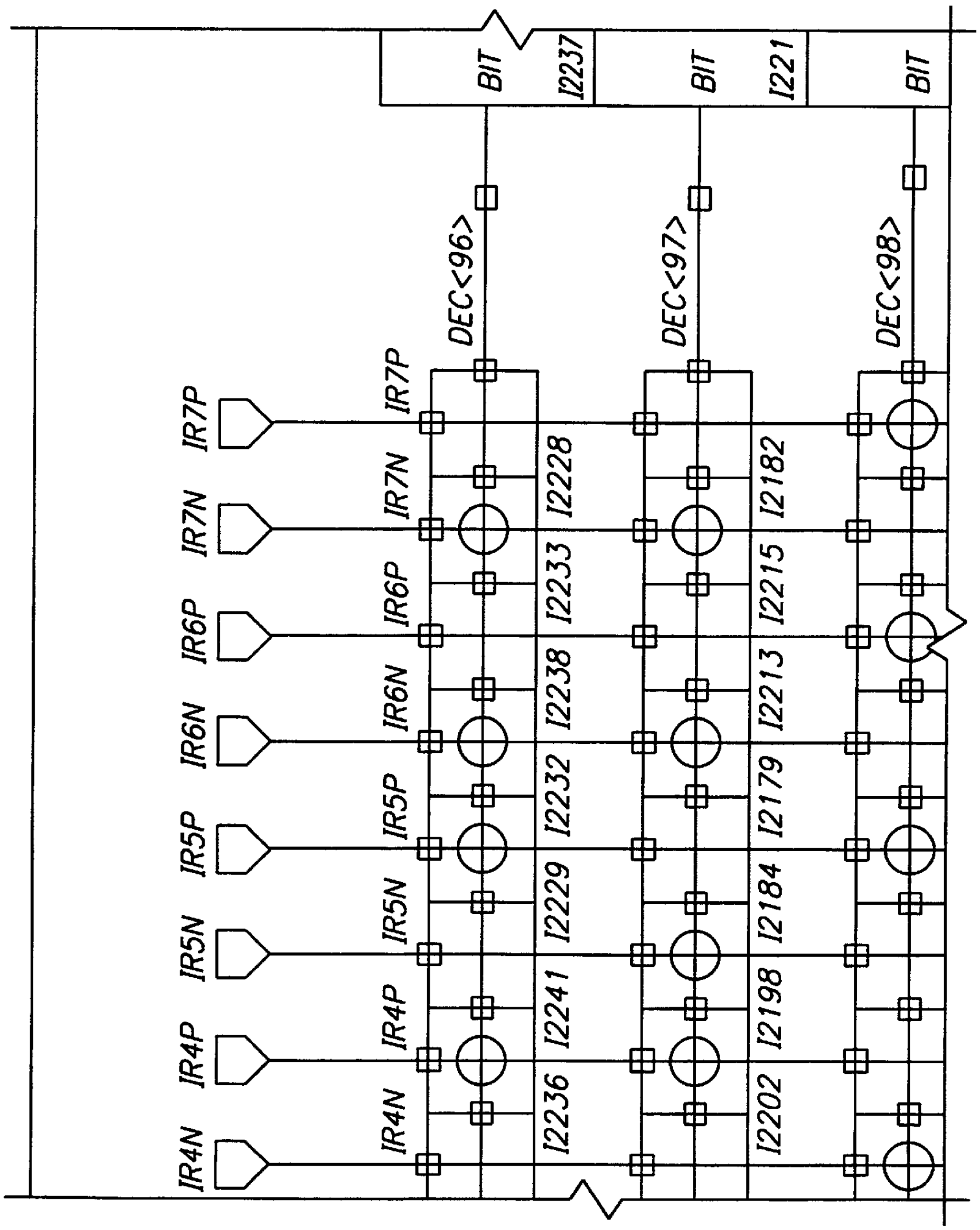
Fig. 7.0504AB

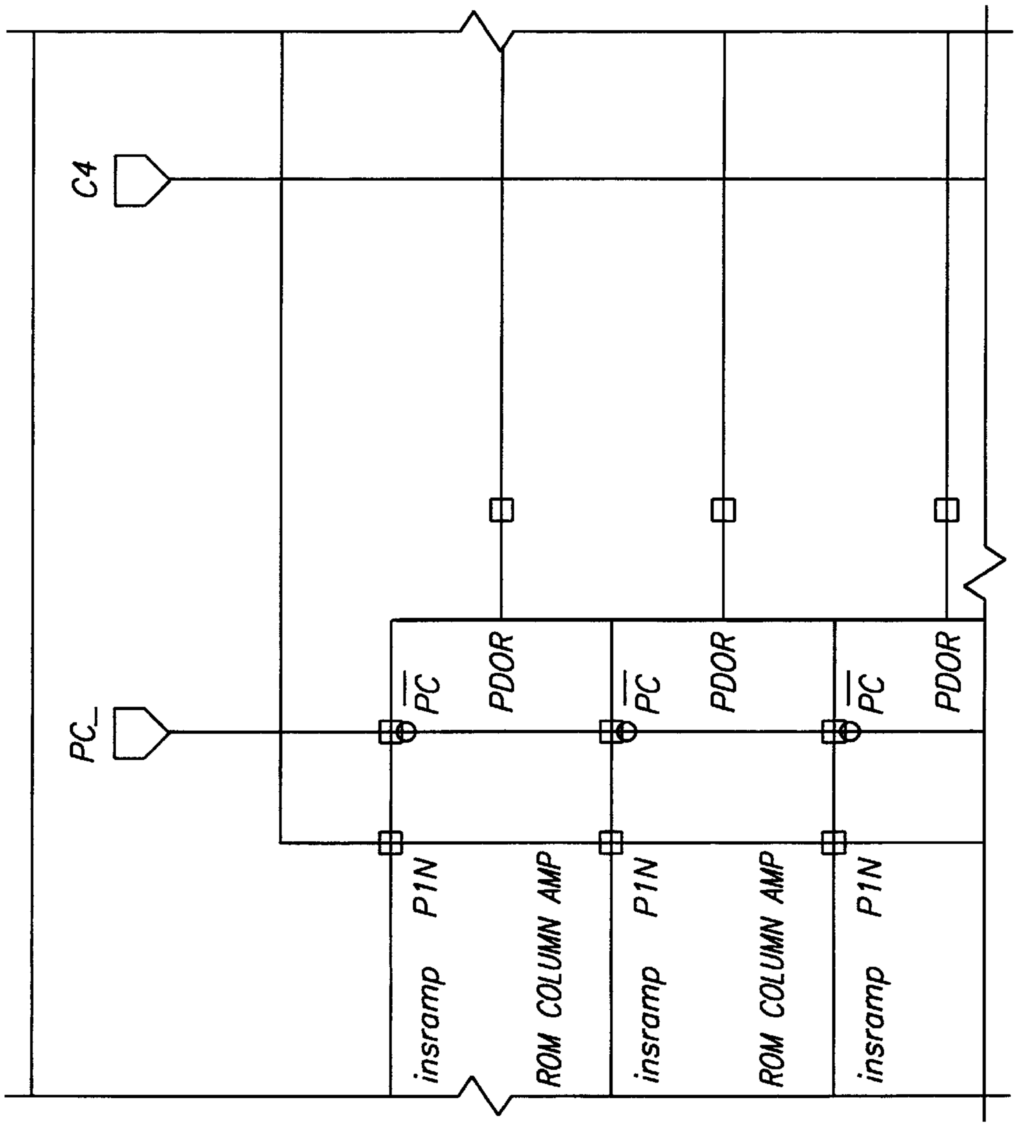
FIG. 7.0604AC

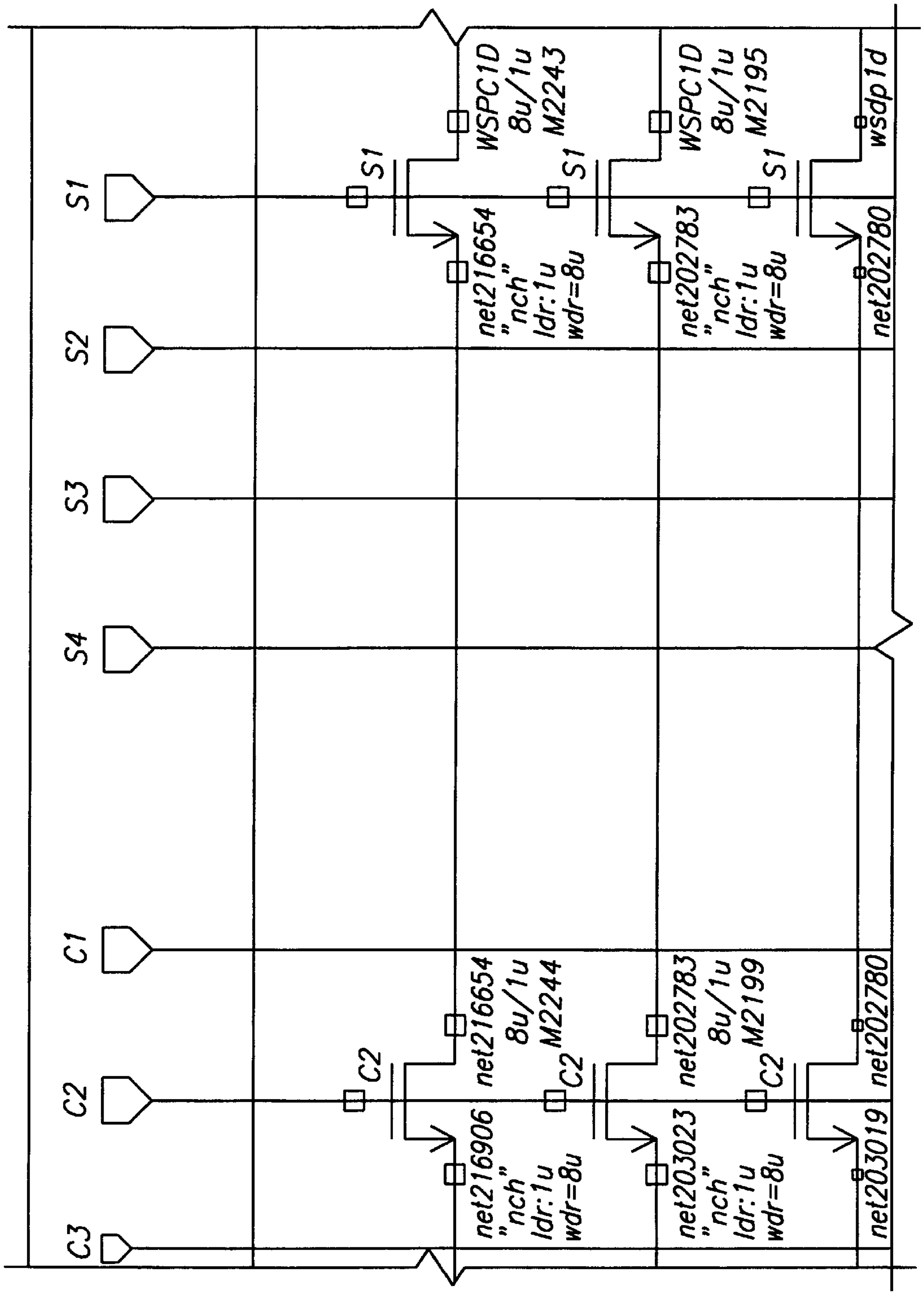
Fig. 7.0604AD

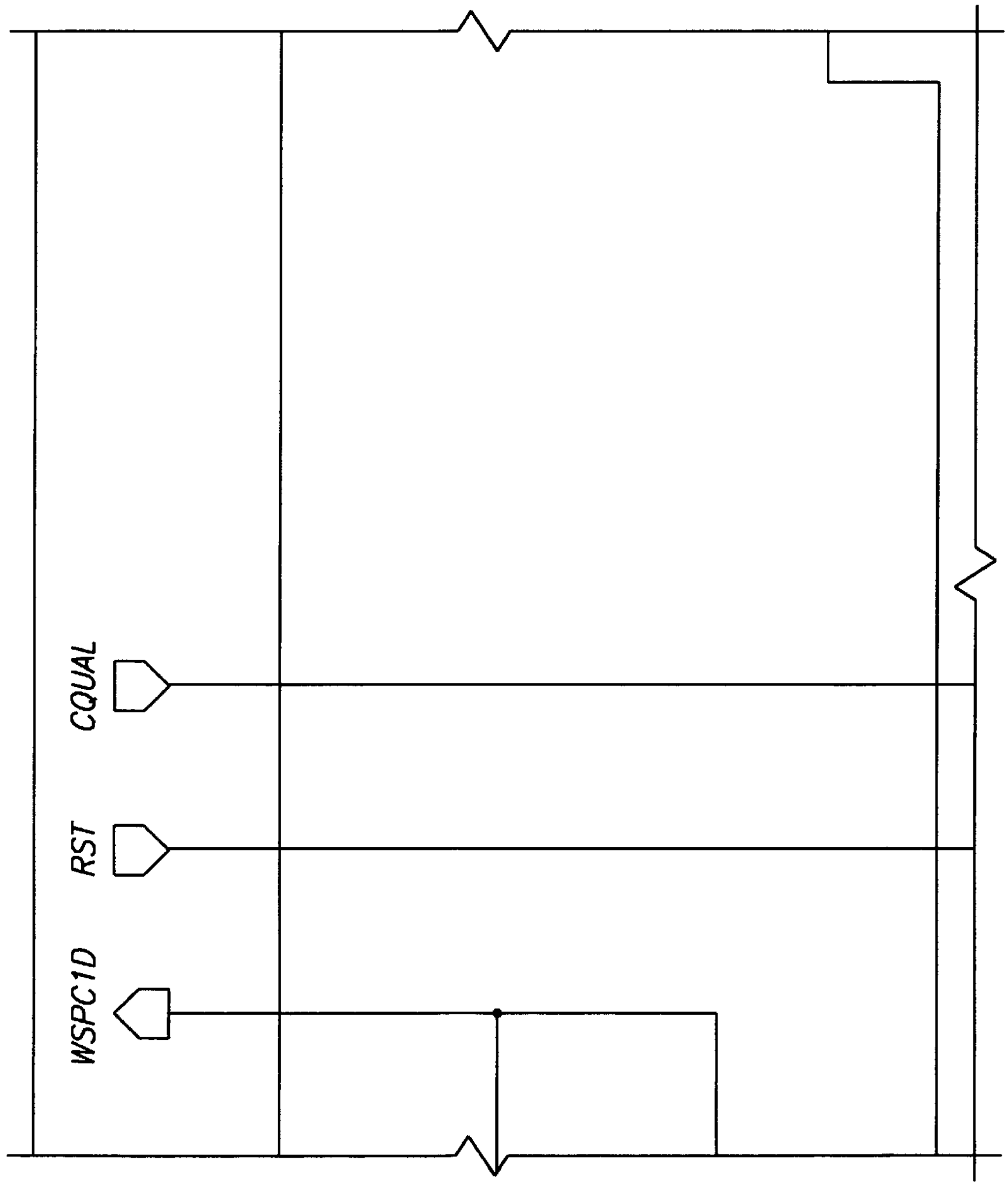
FIG. 7.060.4AE

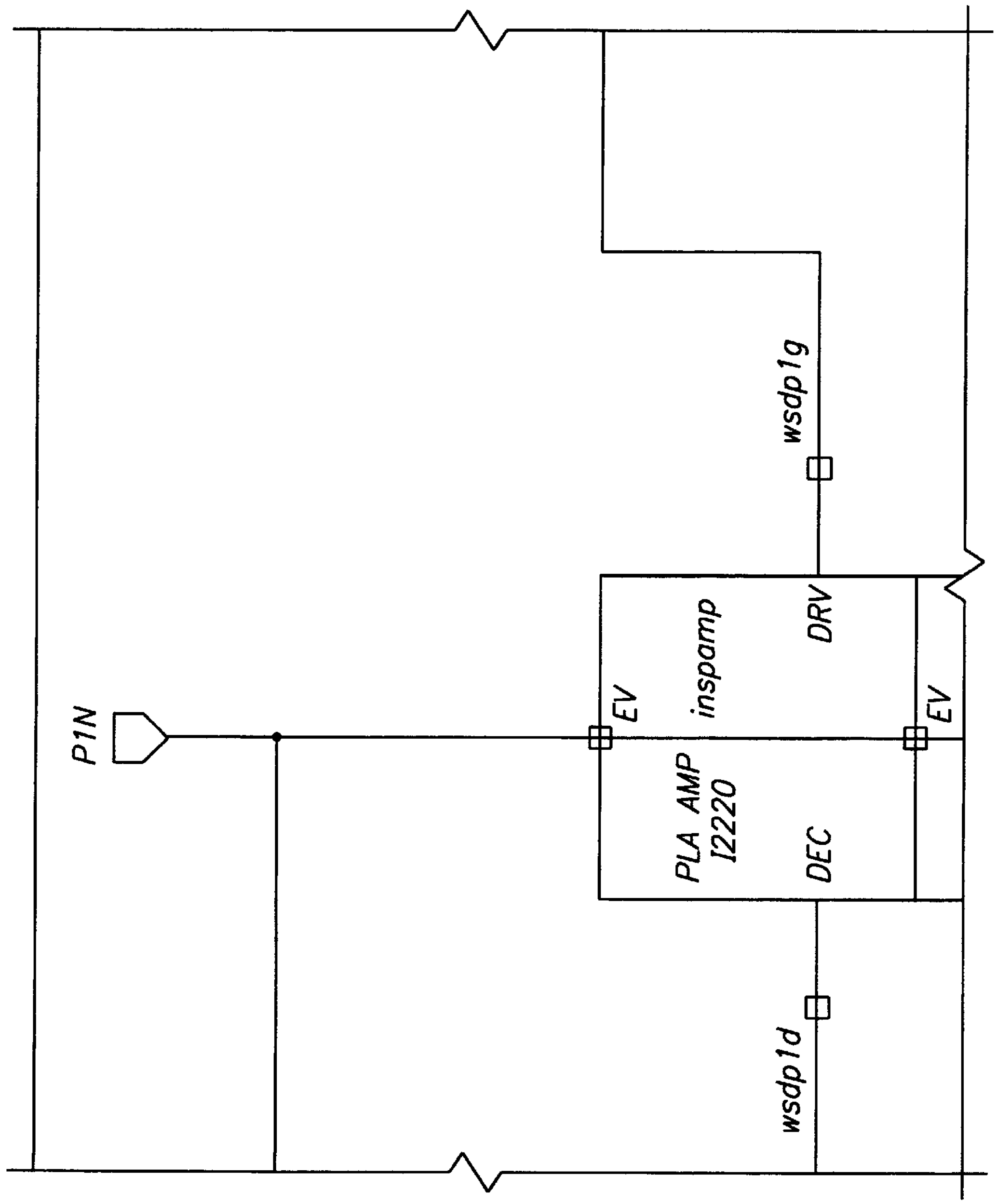
Fig. 7.0604AF

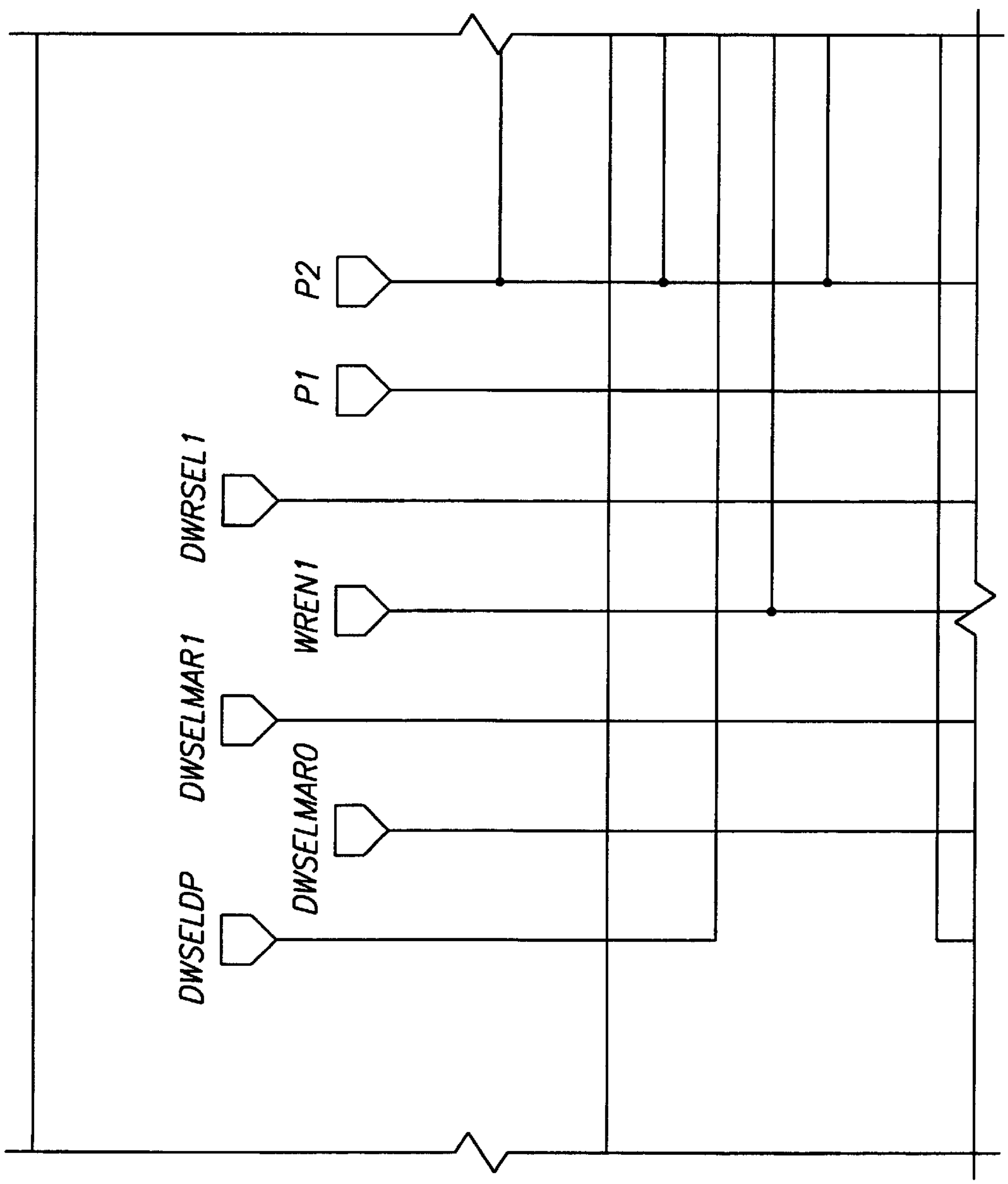
FIG. 7.0604AG

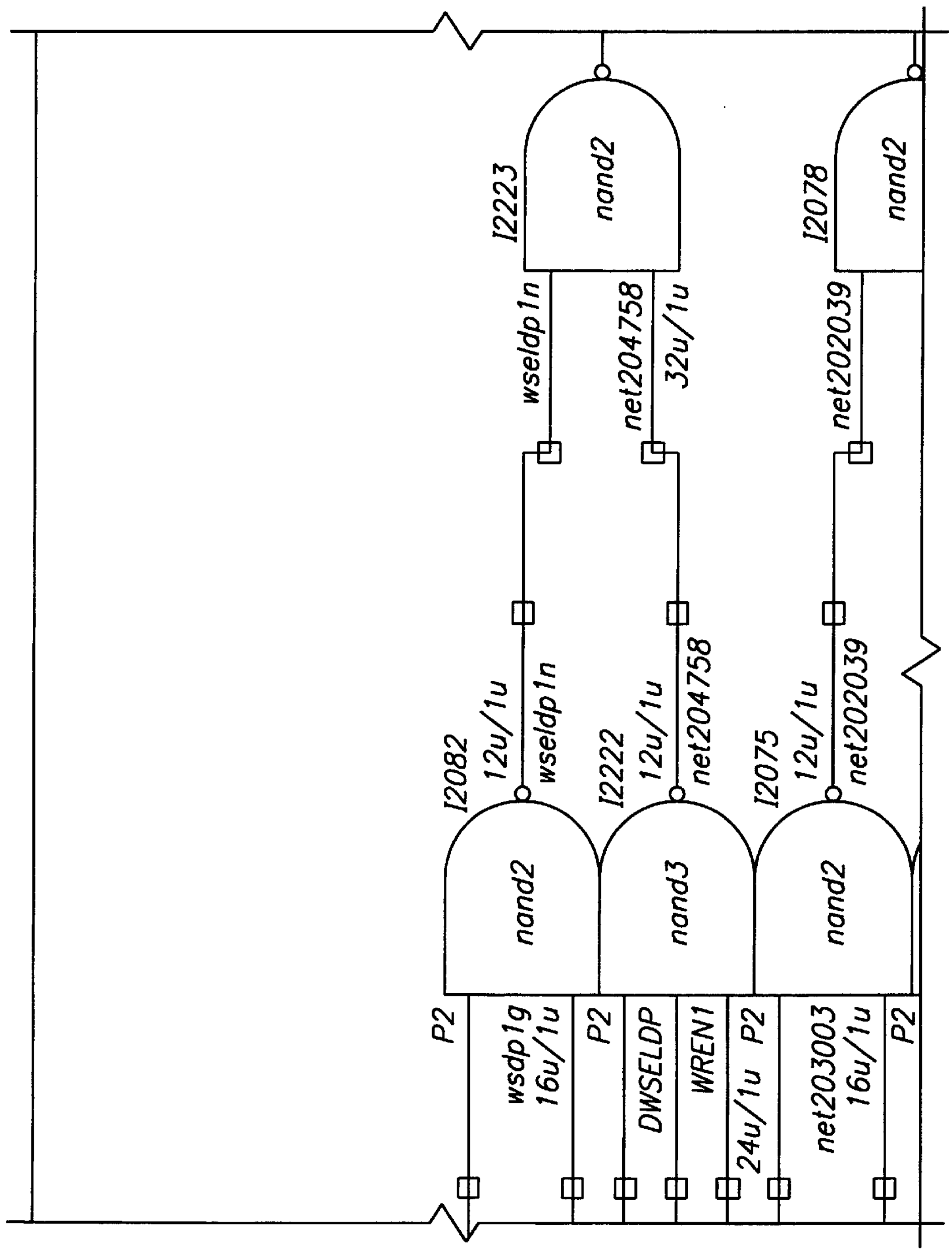
I2223
nand2
I2078
nand2
wseldp1n
net204758
32u/1u
net202039
I2082
12u/1u
wseldp1n
I2222
12u/1u
net204758
I2075
12u/1u
net202039
nand2
nand3
nand2
P2
wsdp1g
16u/1u
P2
DWSELDP
WREN1
P2
24u/1u
net203003
16u/1u
P2

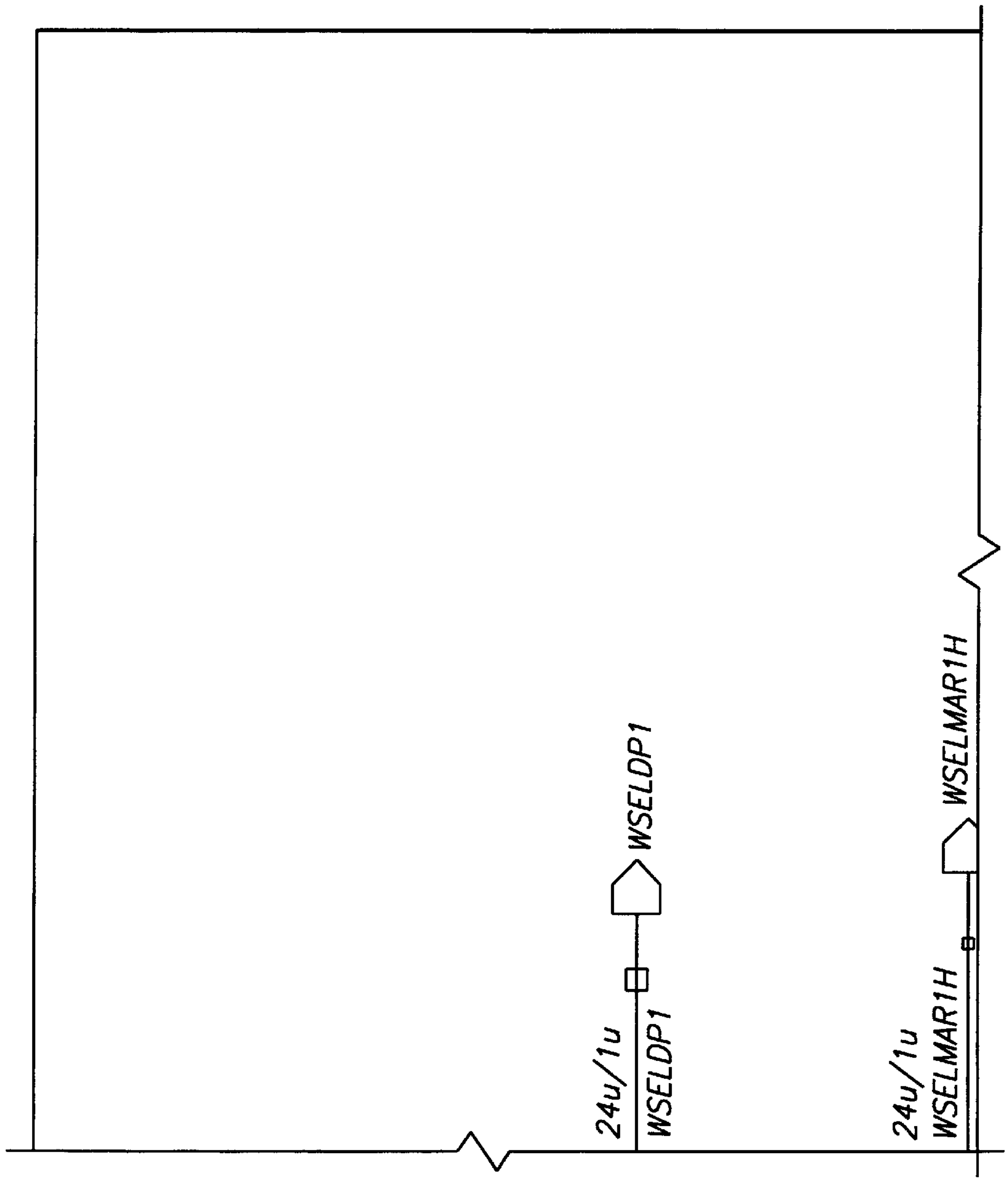
FIG. 7.060.4AI

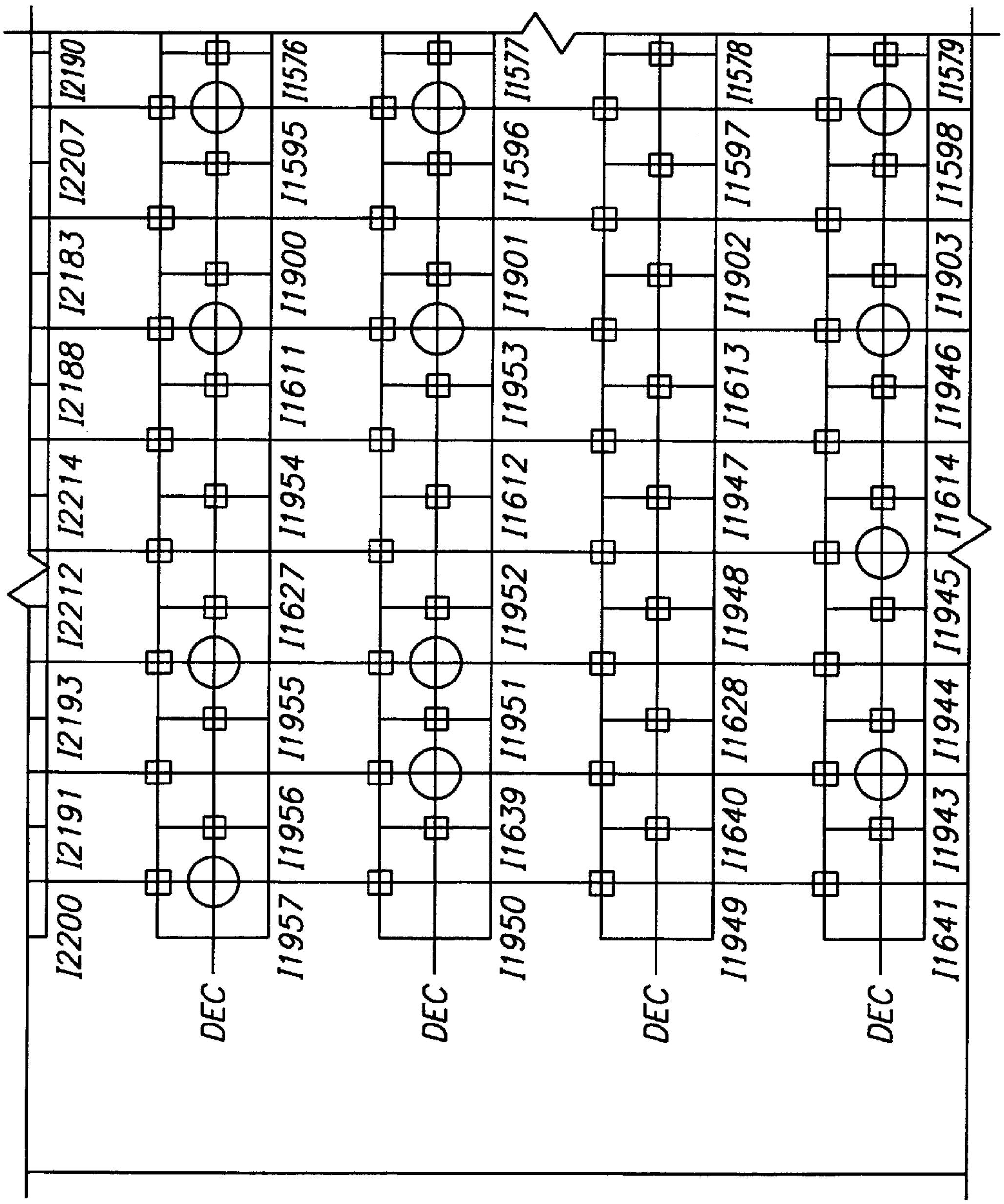
FIG. 7.0604BA

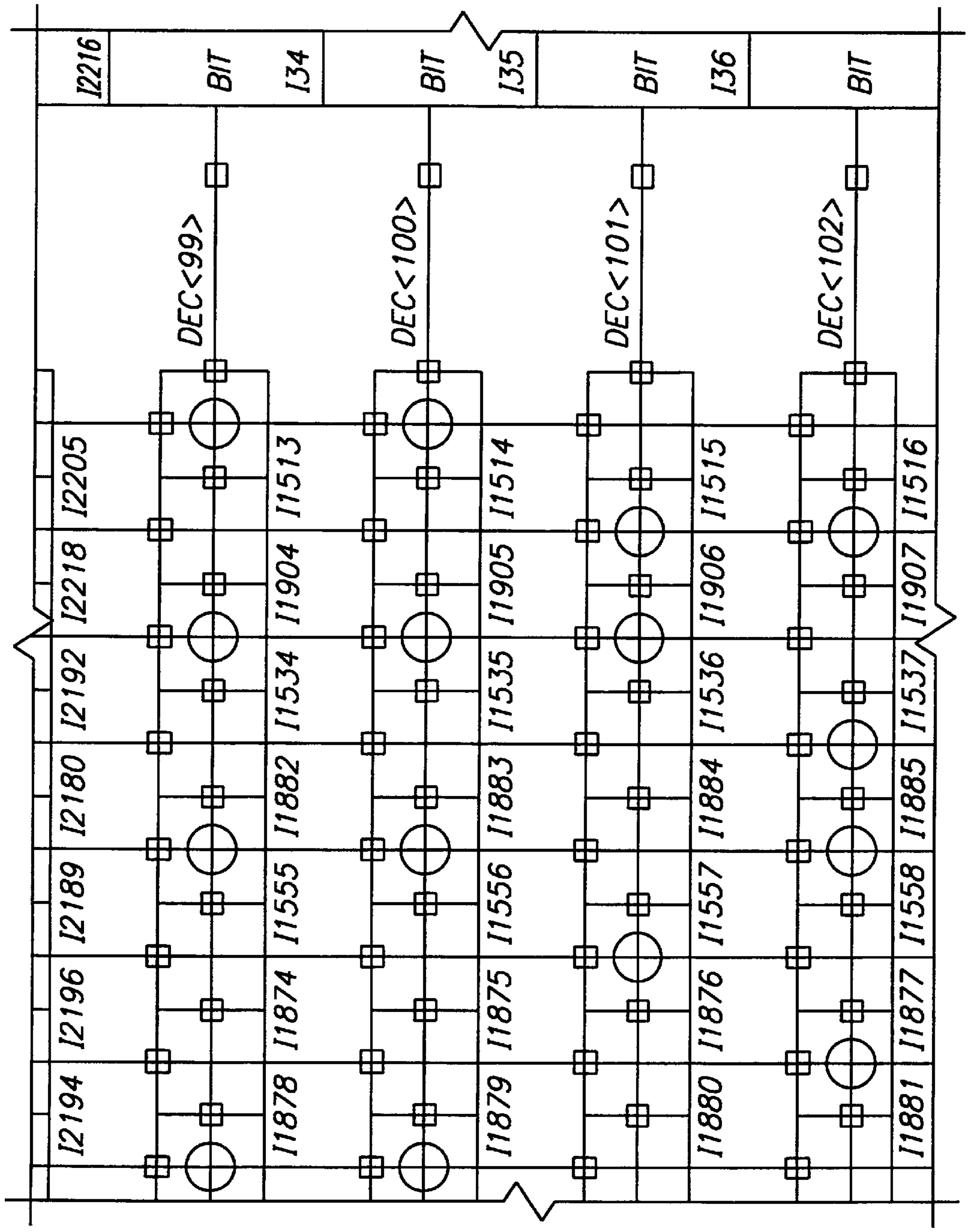
FIG. 7.0604BB

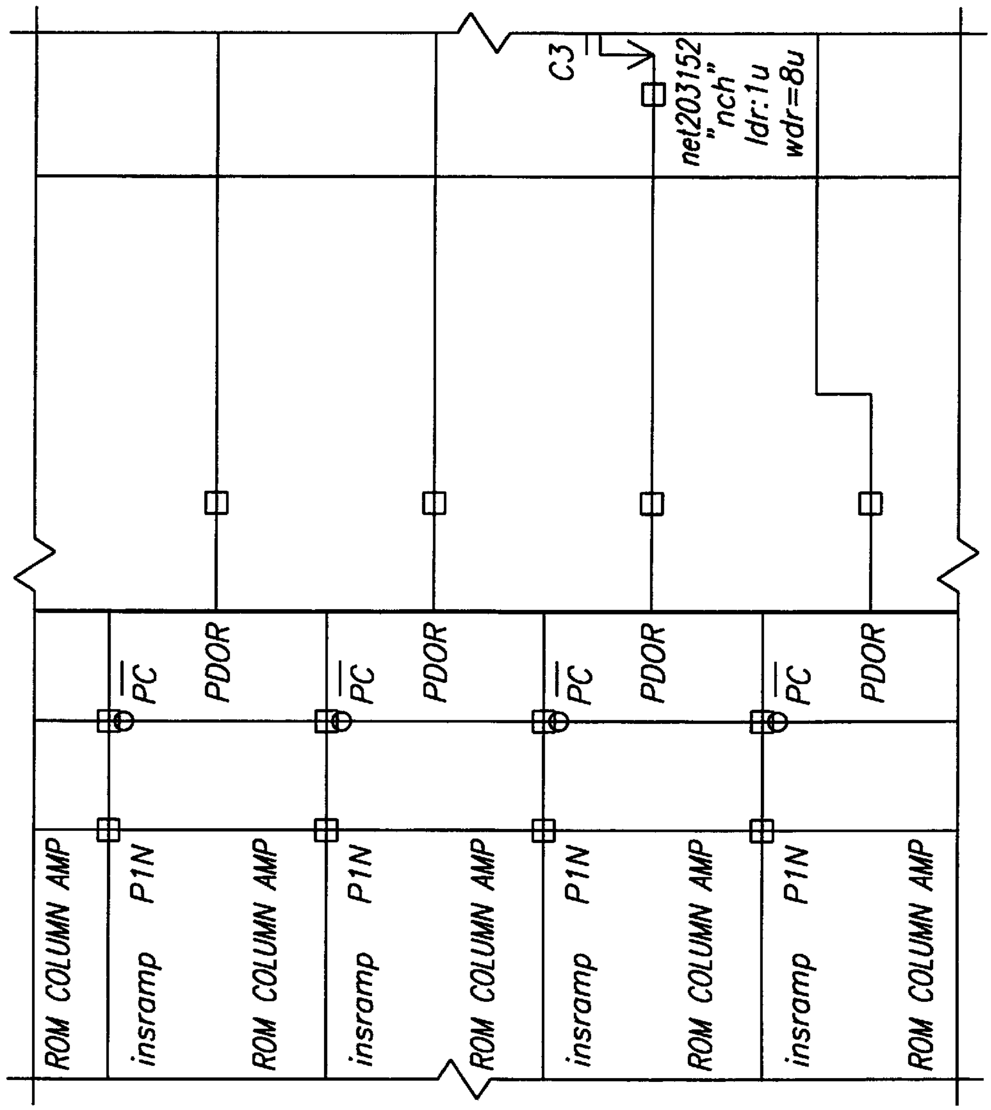
Fig. 7.0604BC

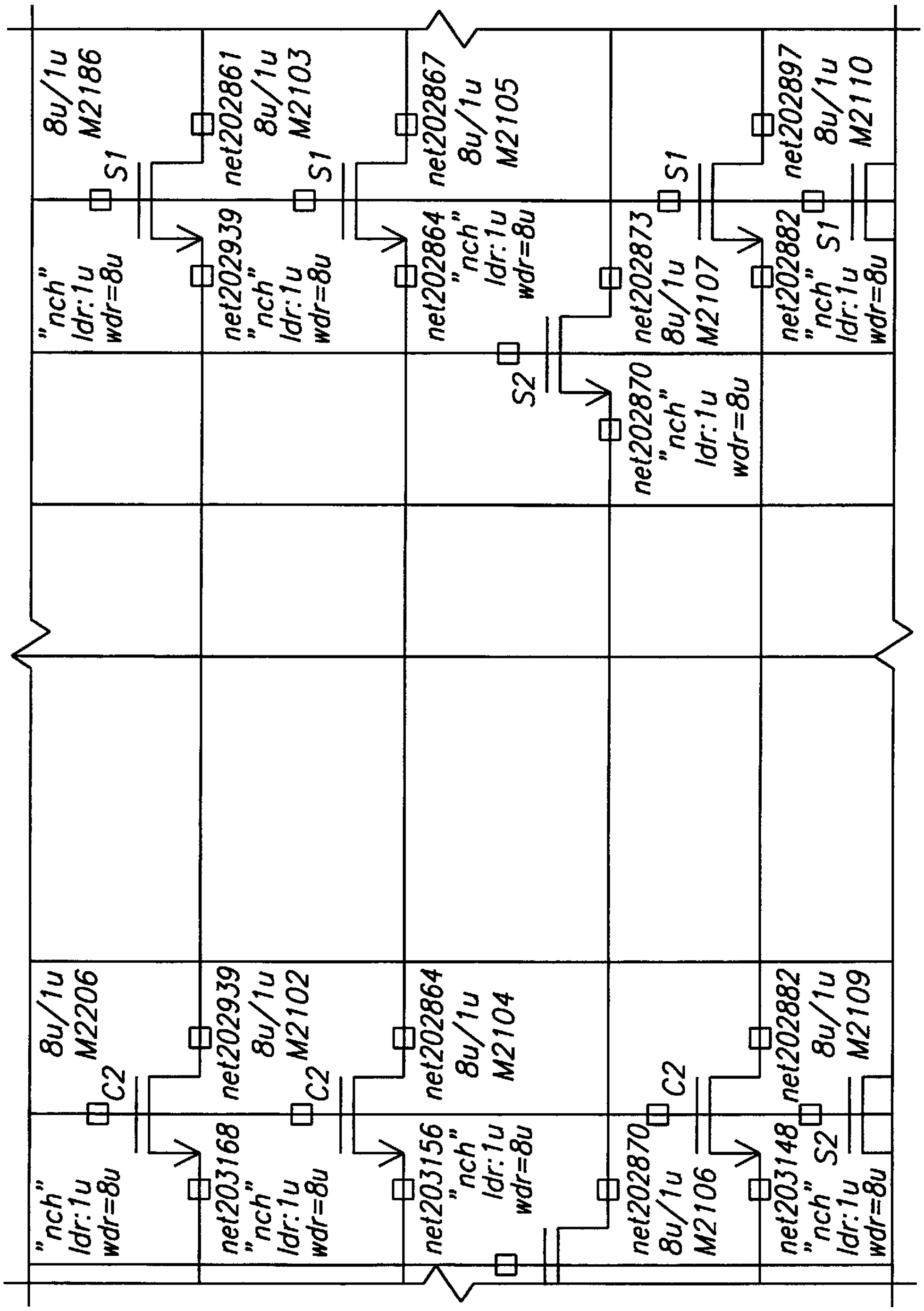
Fig. 7.060-4BD

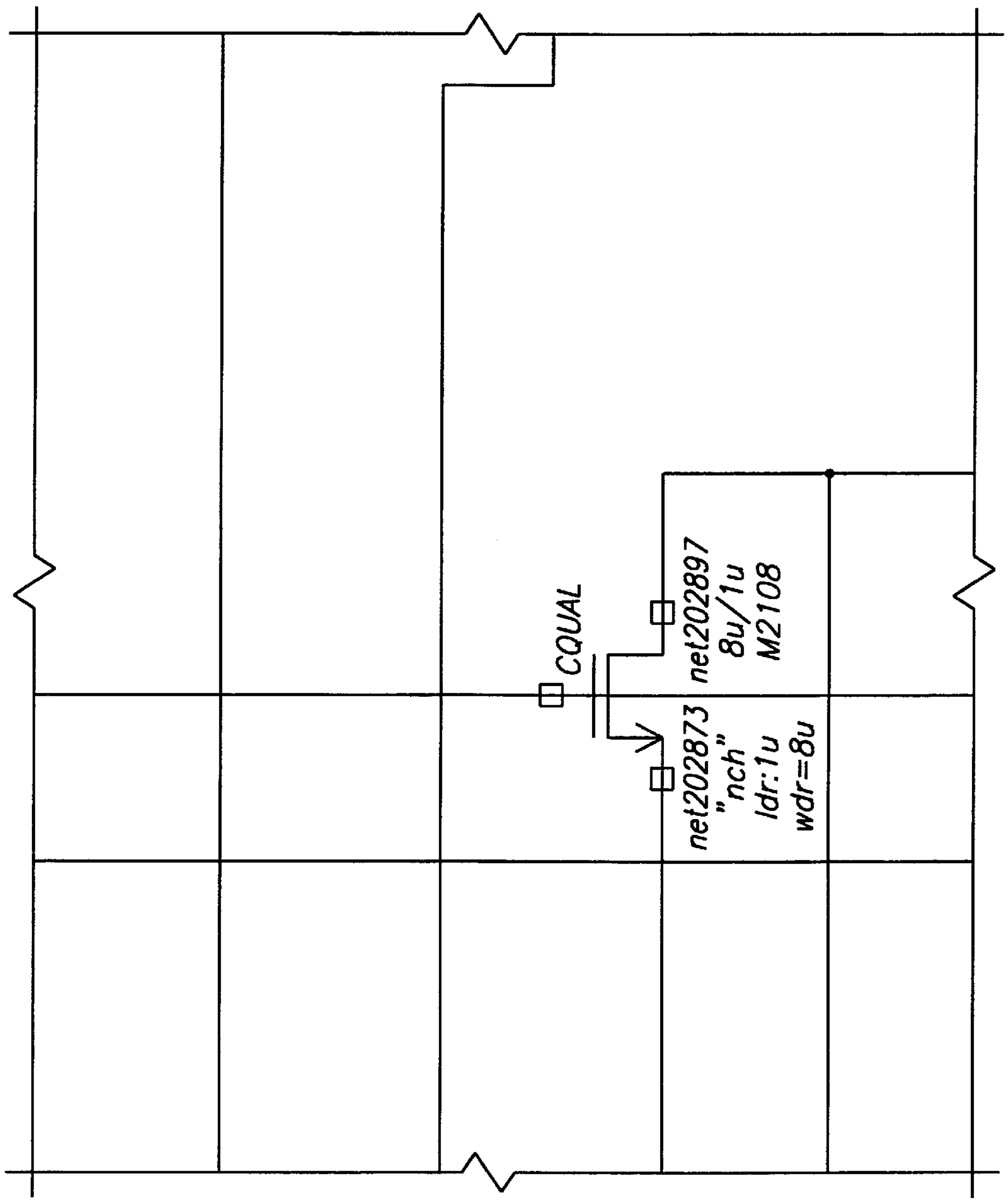
FIG. 7.0604BE

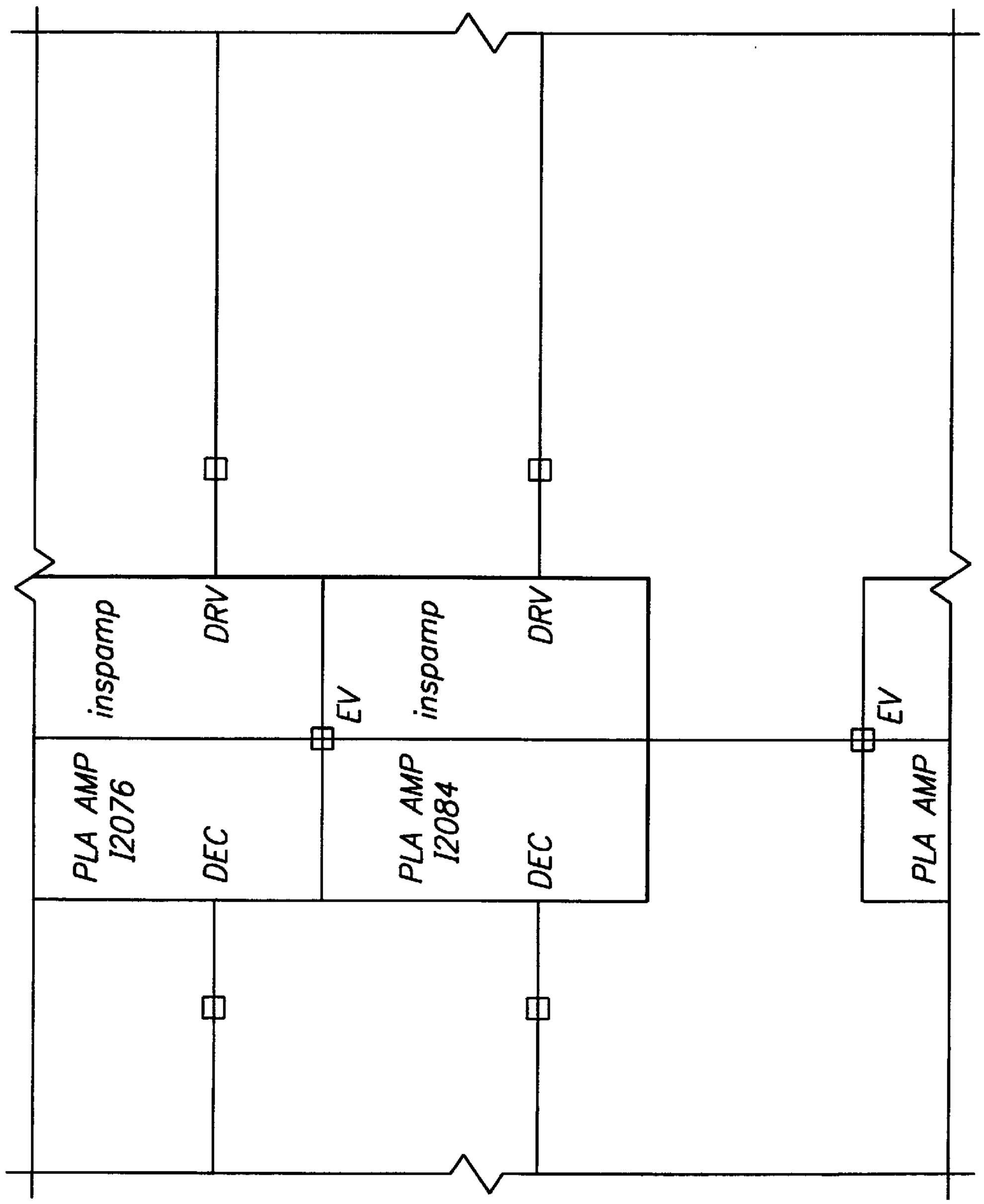
Fig. 1.0604BF

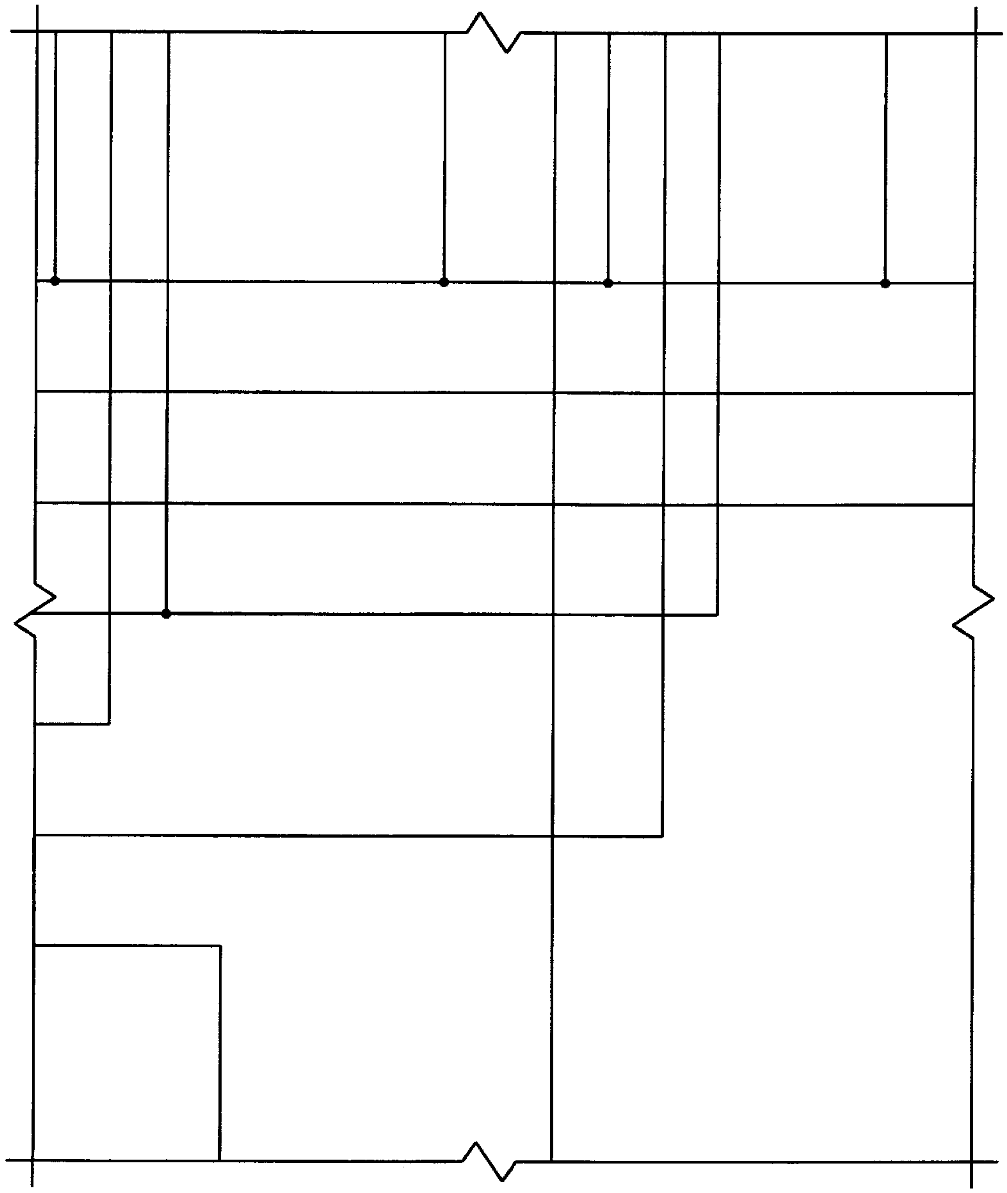
Fig. 7.0604BG

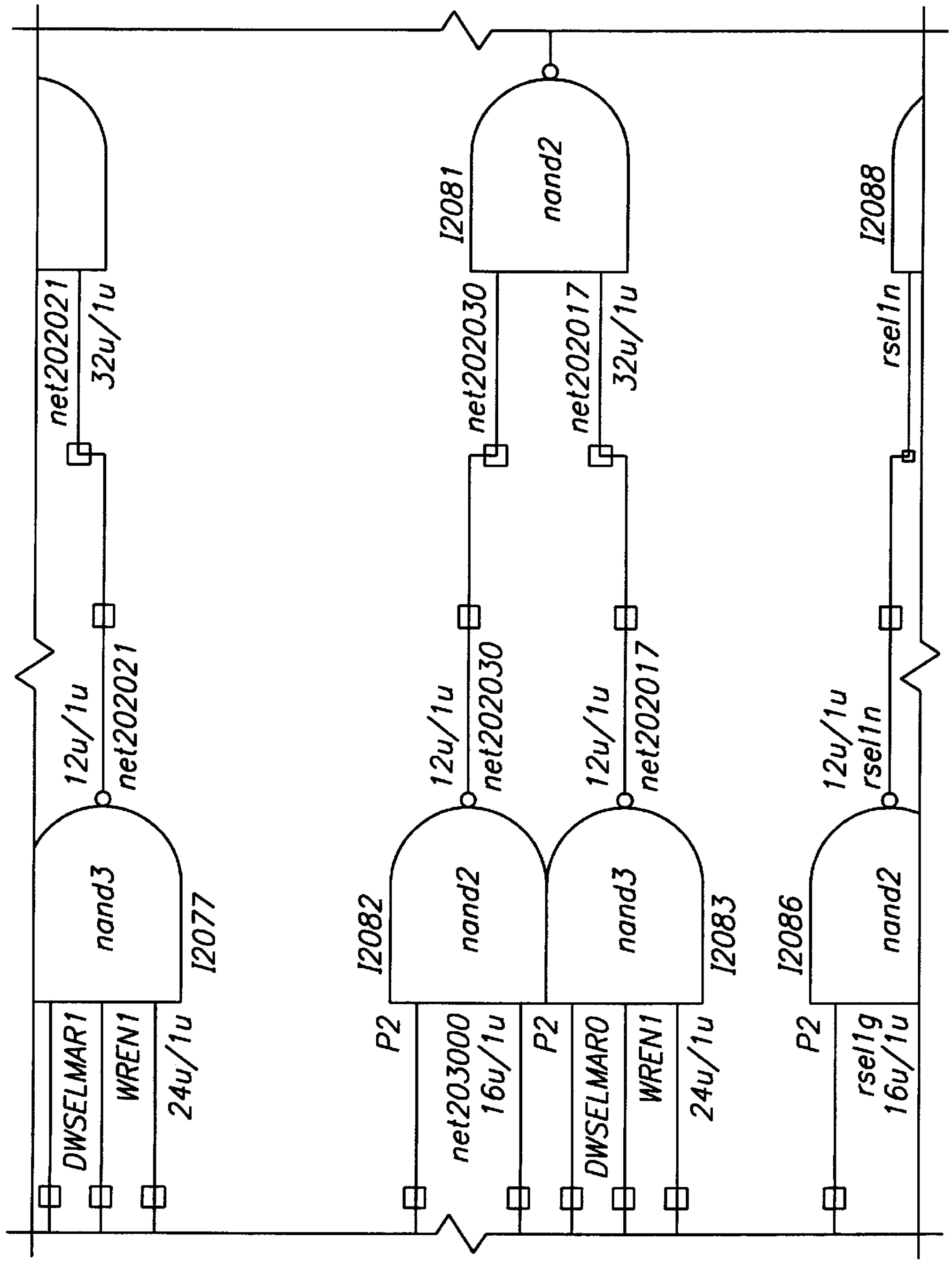
FIG. 7.0604BH

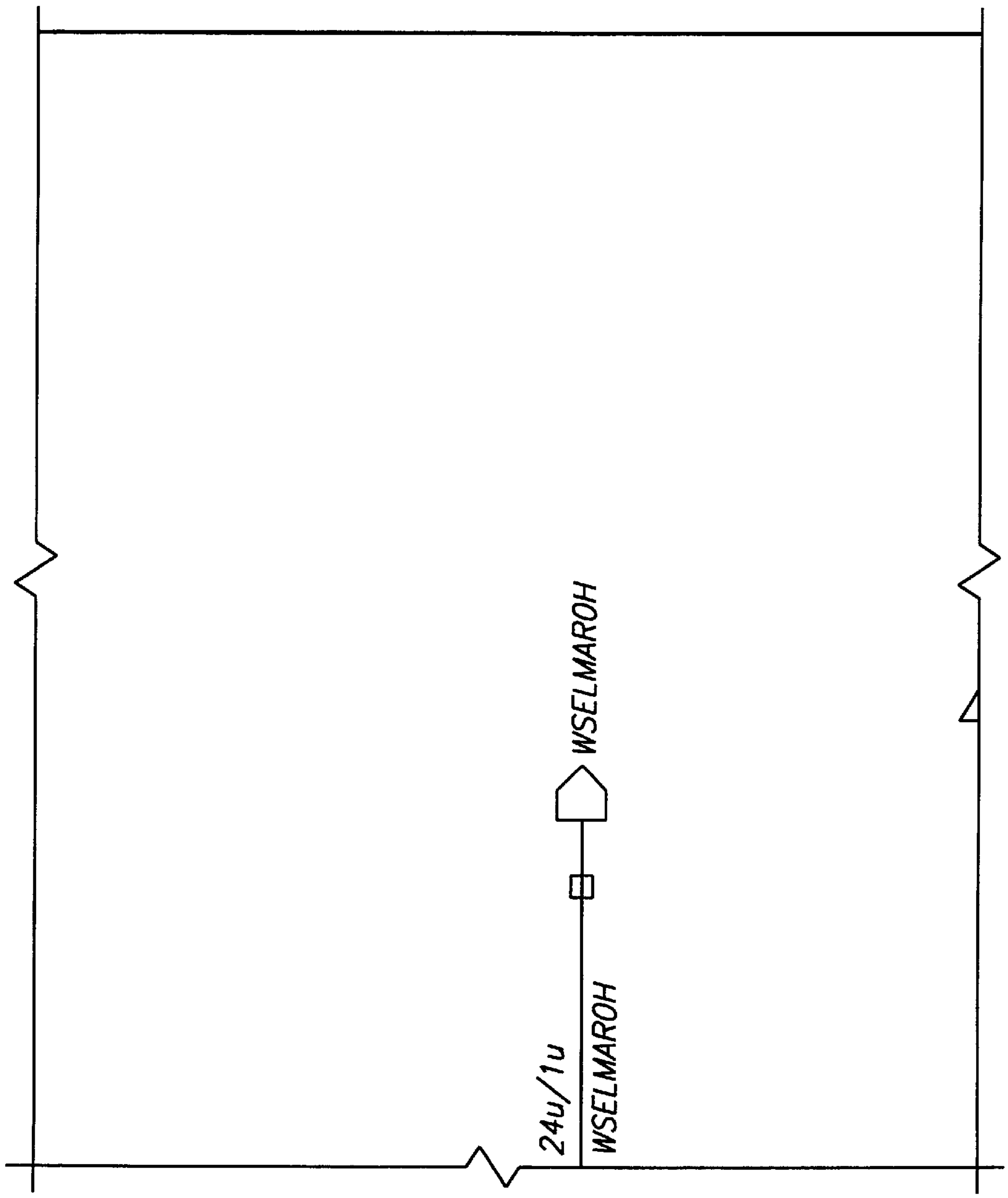
FIG. 7.0690.4BII

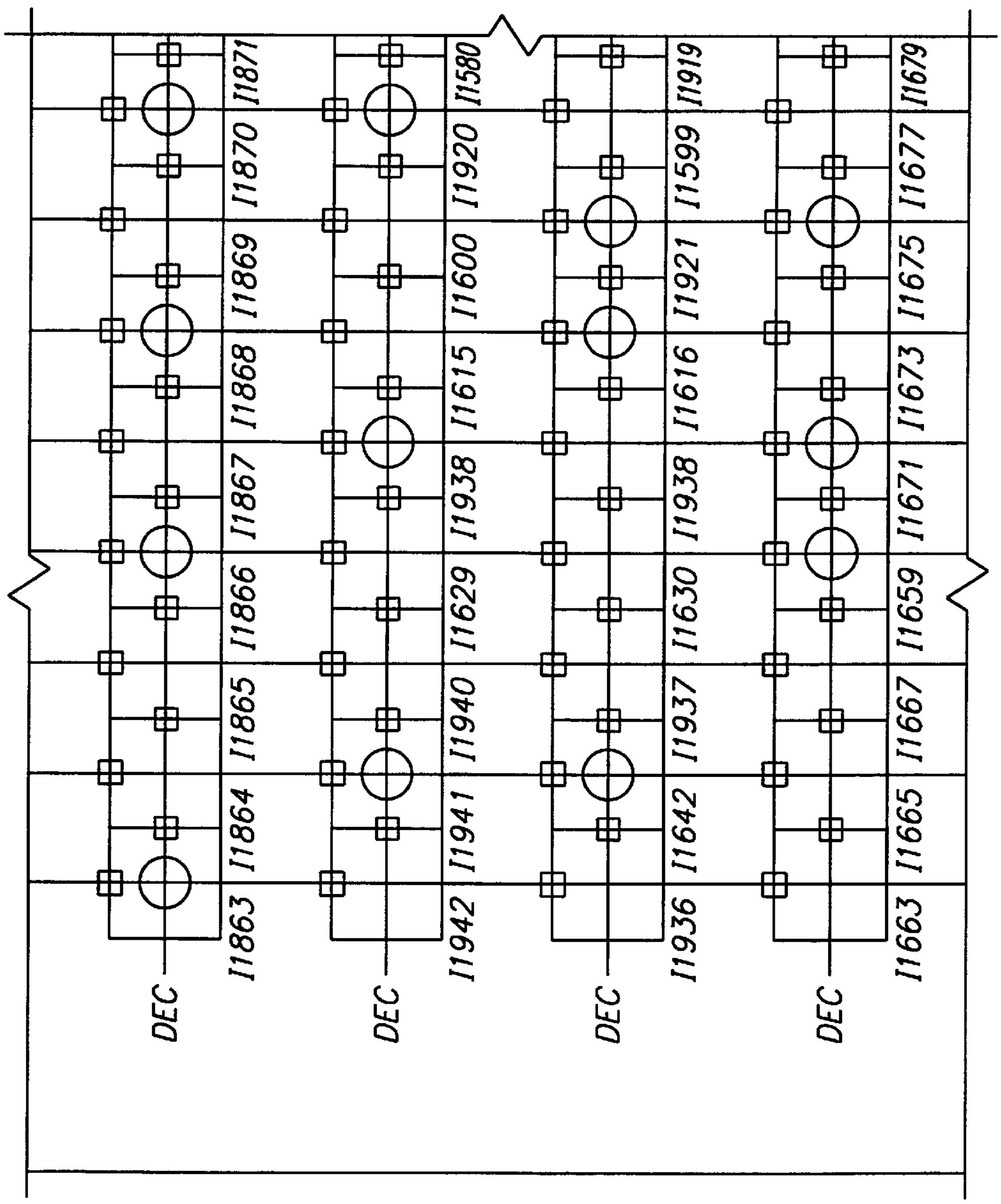
FIG. 7.0604CA

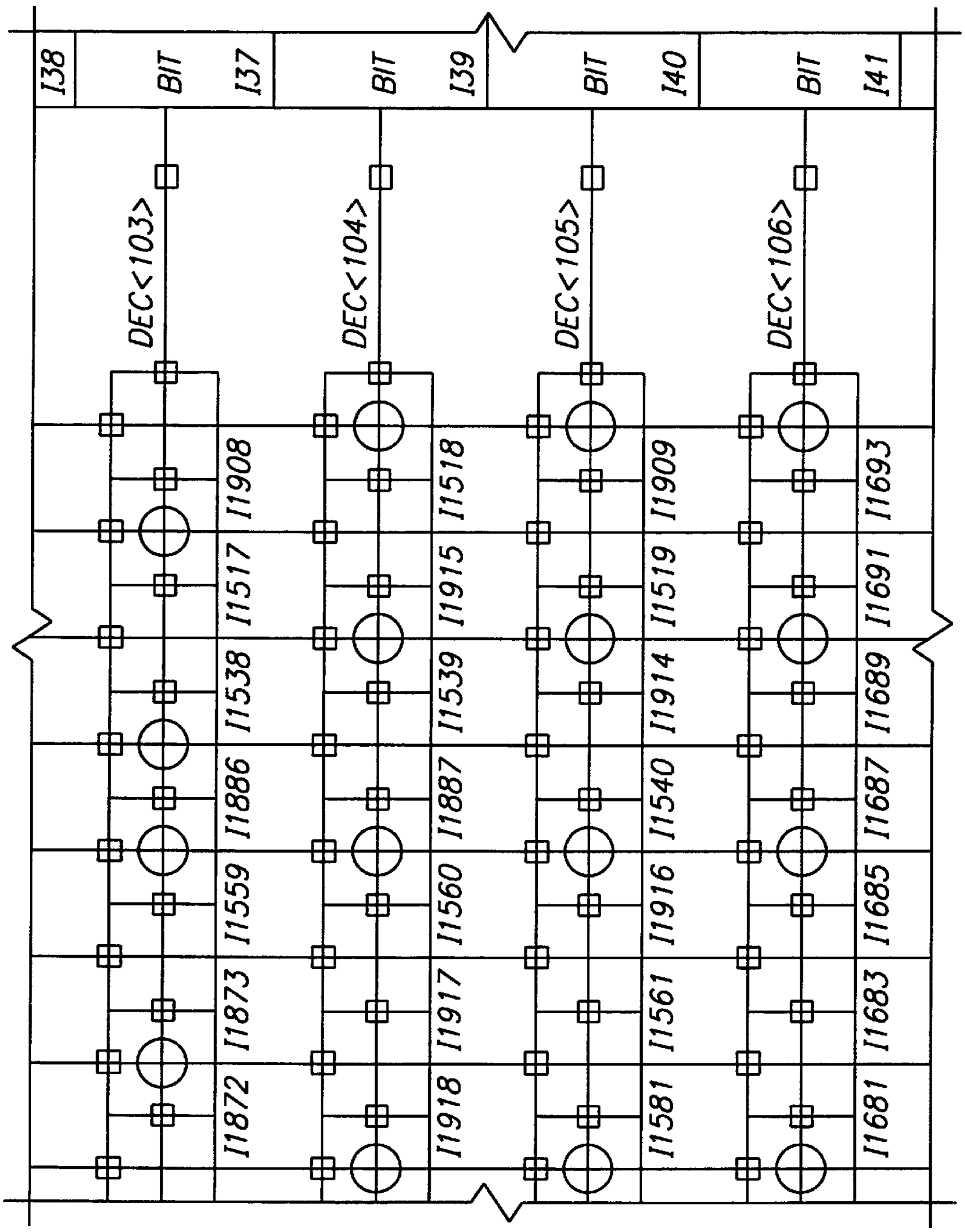
FIG. 1.0604CB

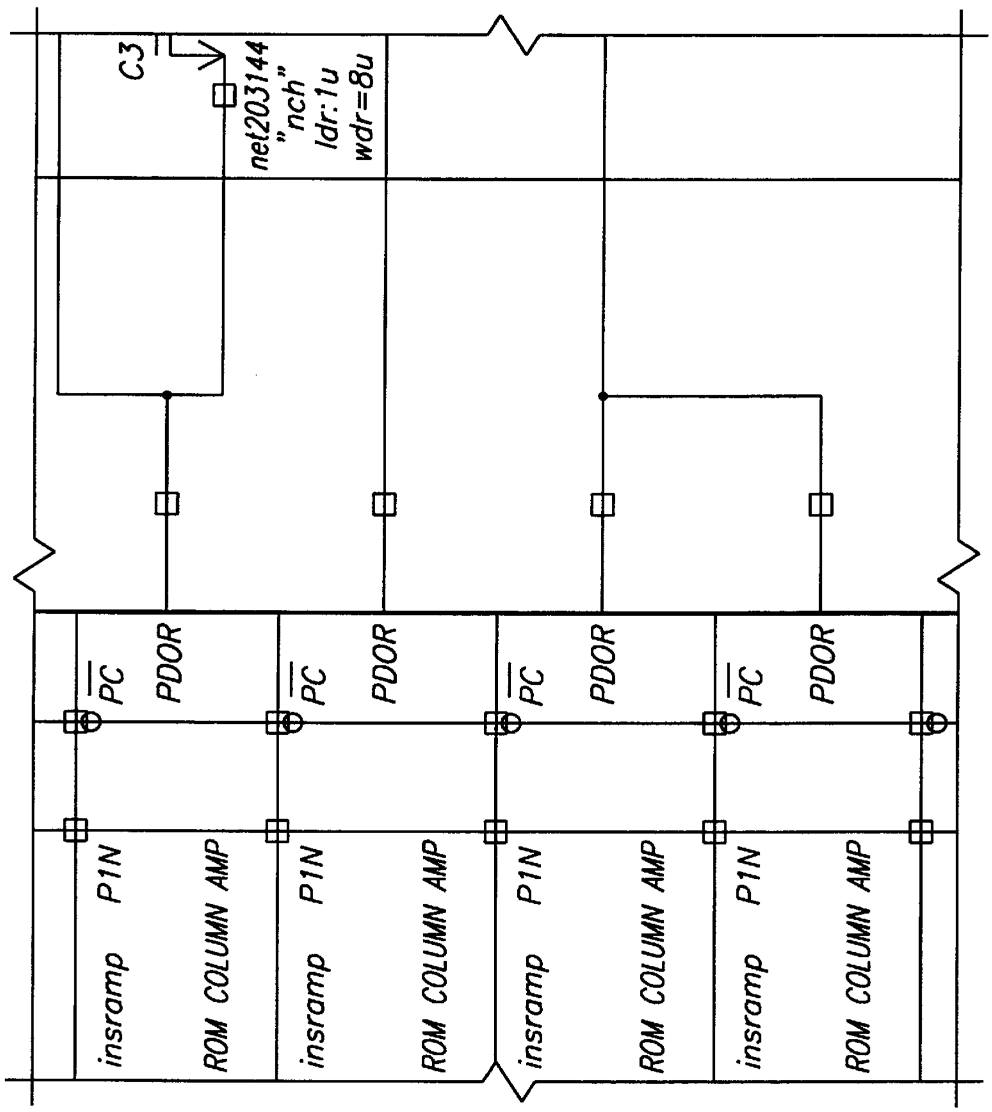
FIG. 7.0604CC

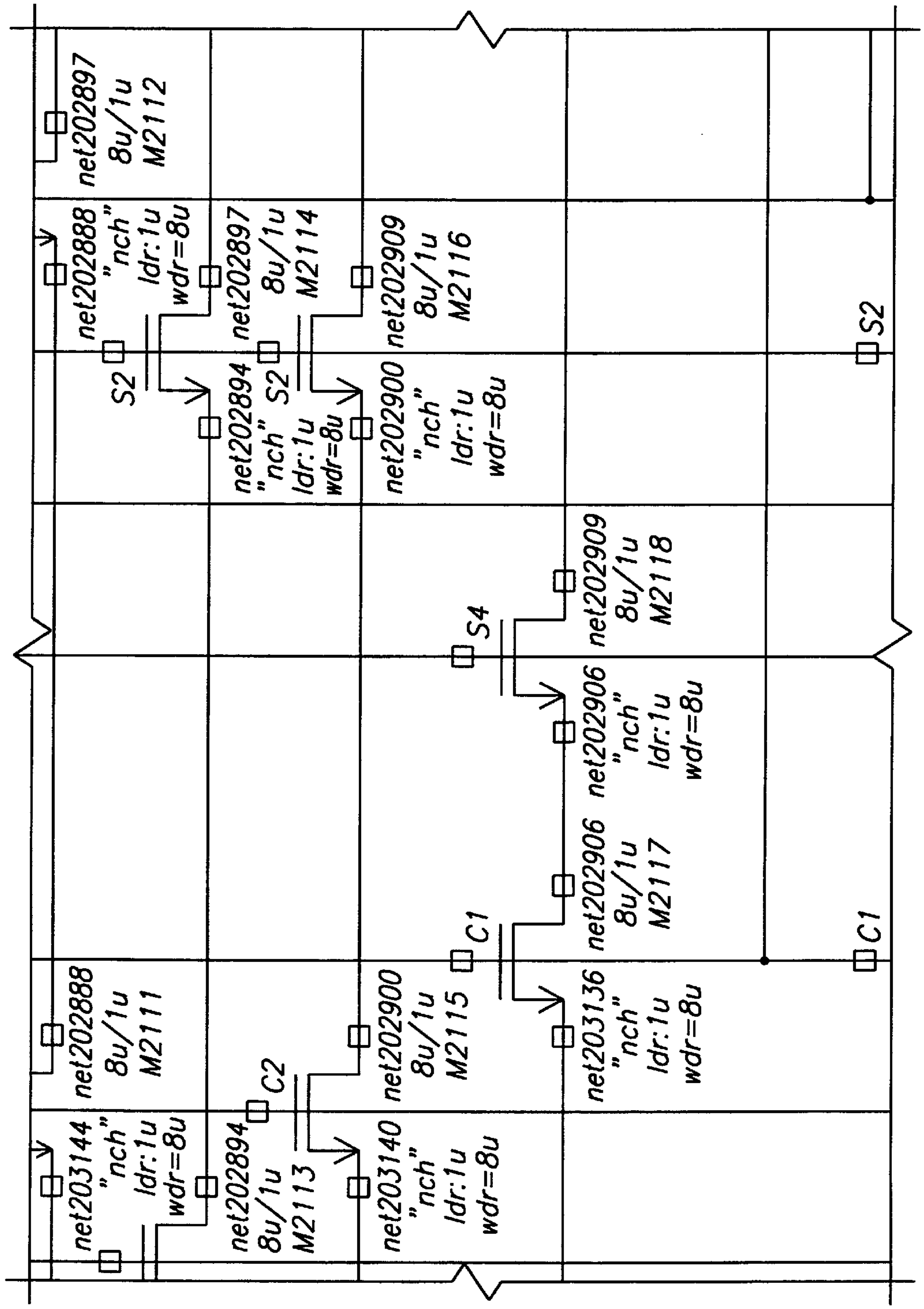
FIG. 7.0060CD

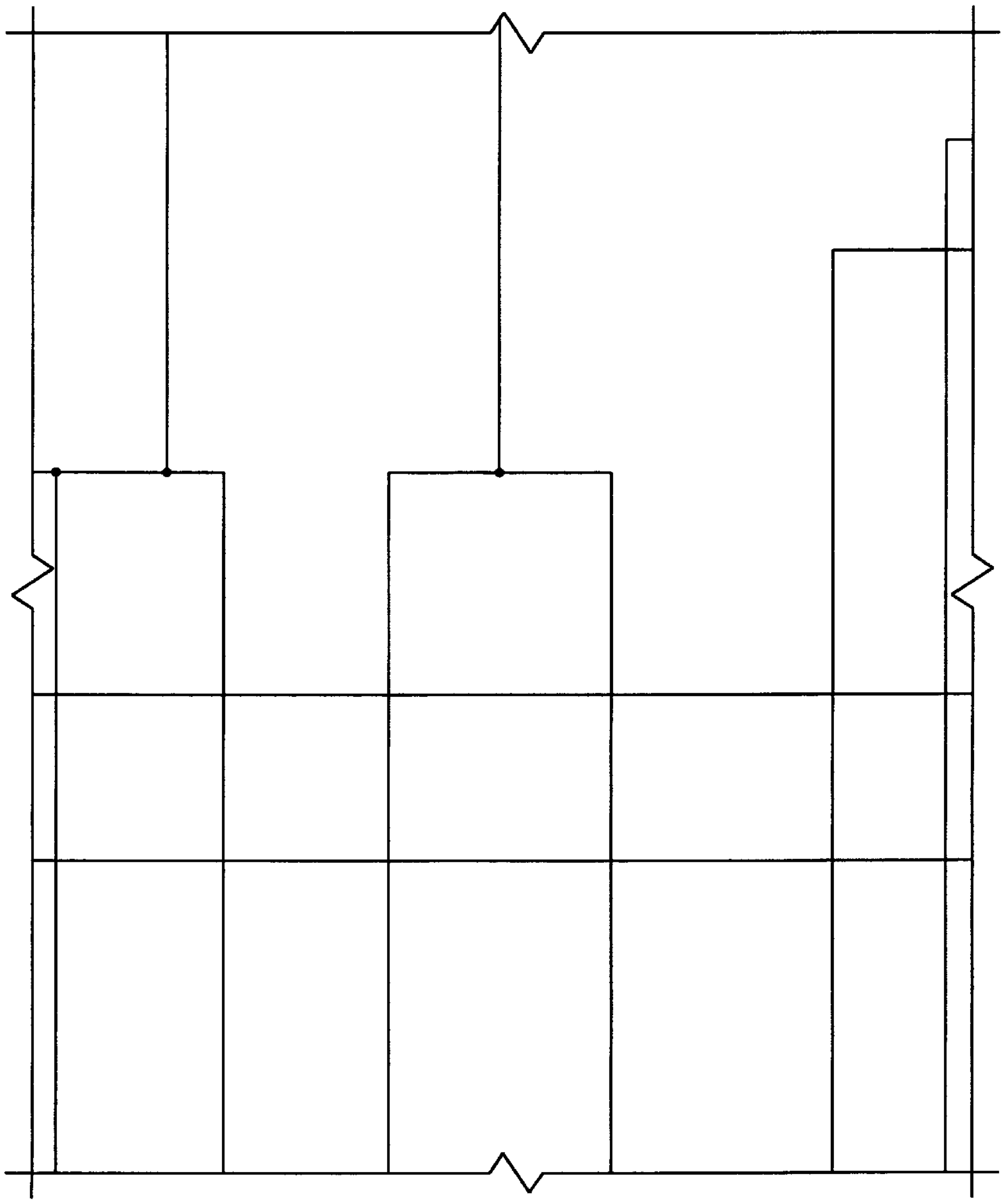
Fig 7.060.4C

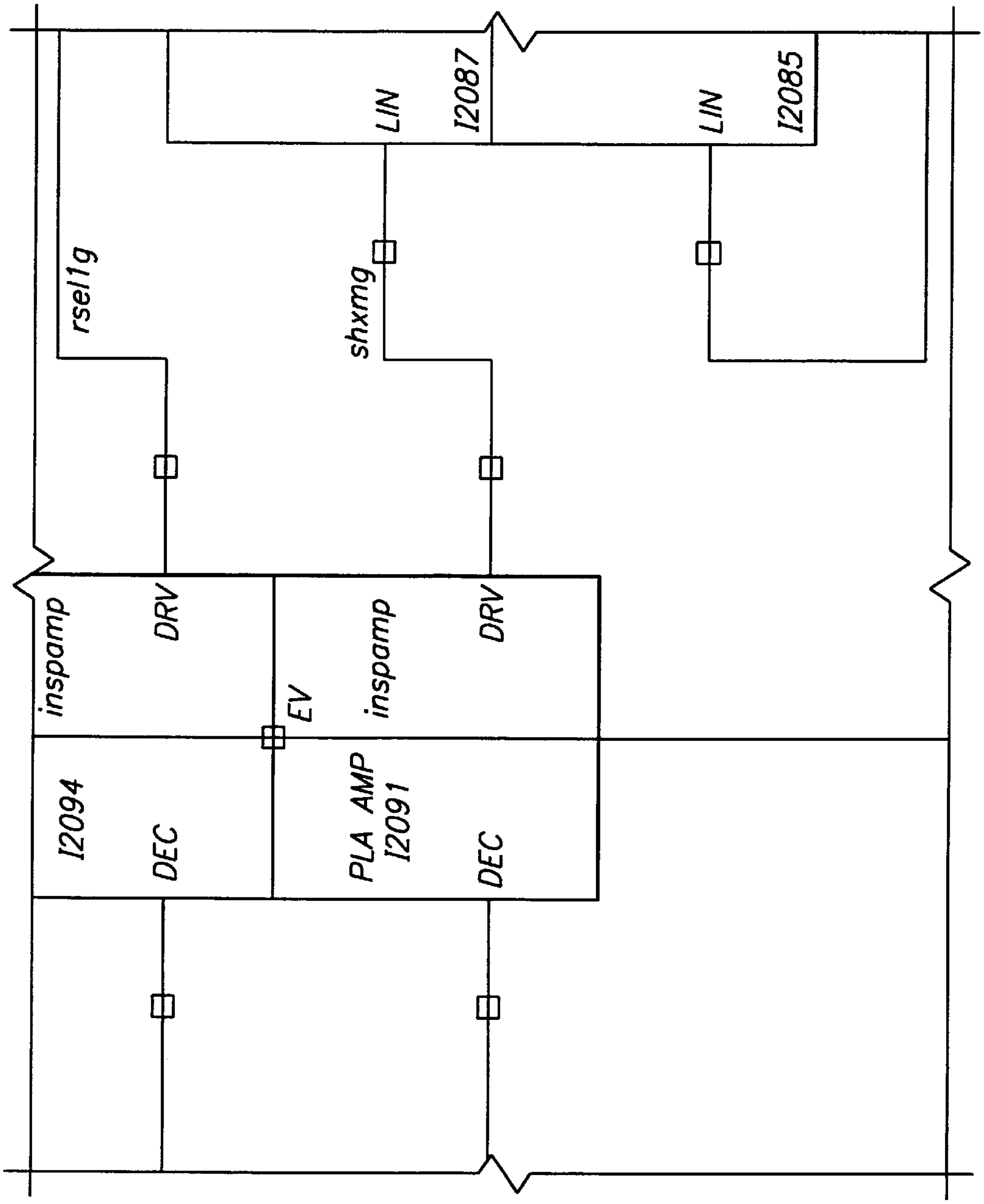
FIG. 7.060.4CF

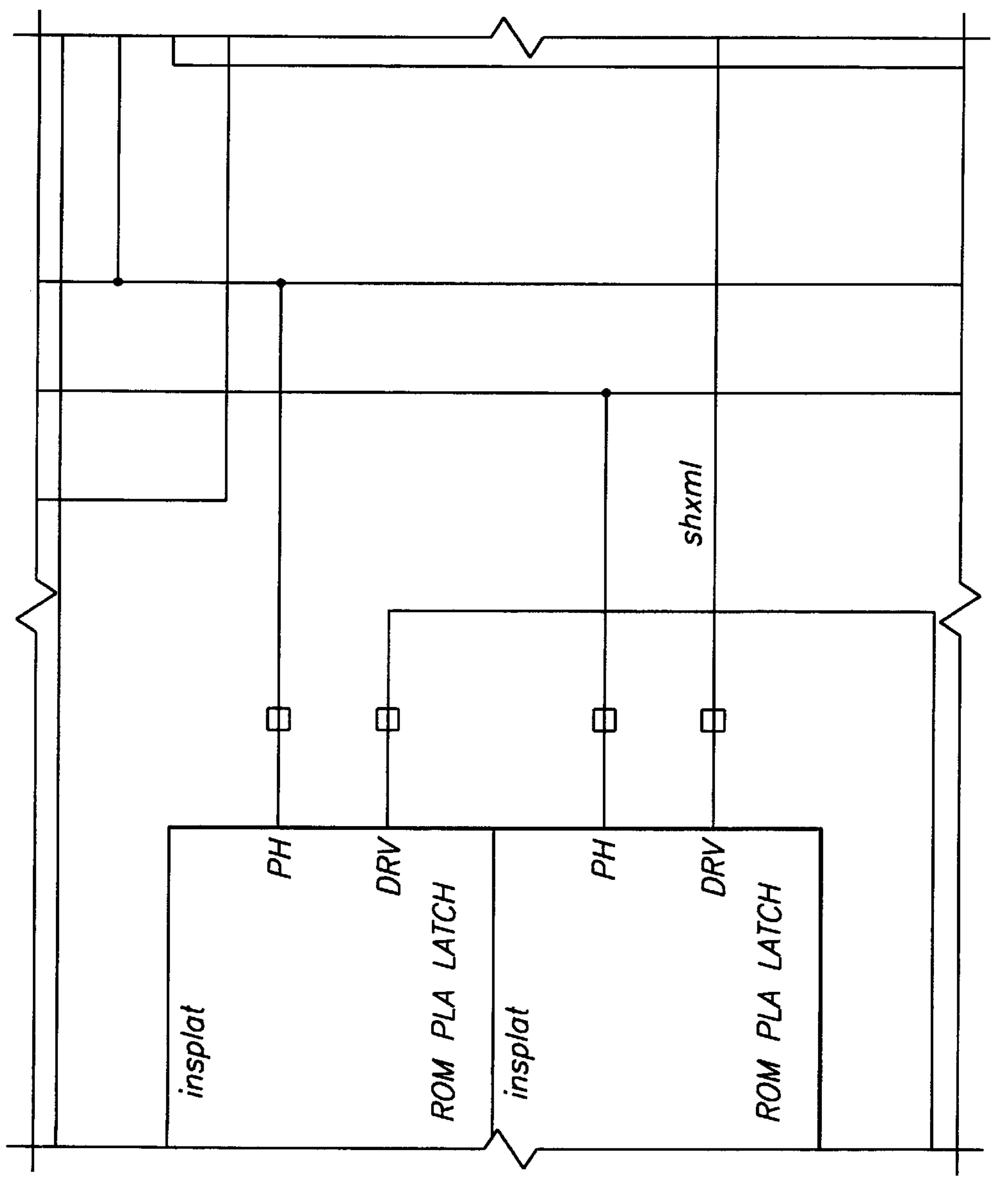
Fig. 7.0604CG

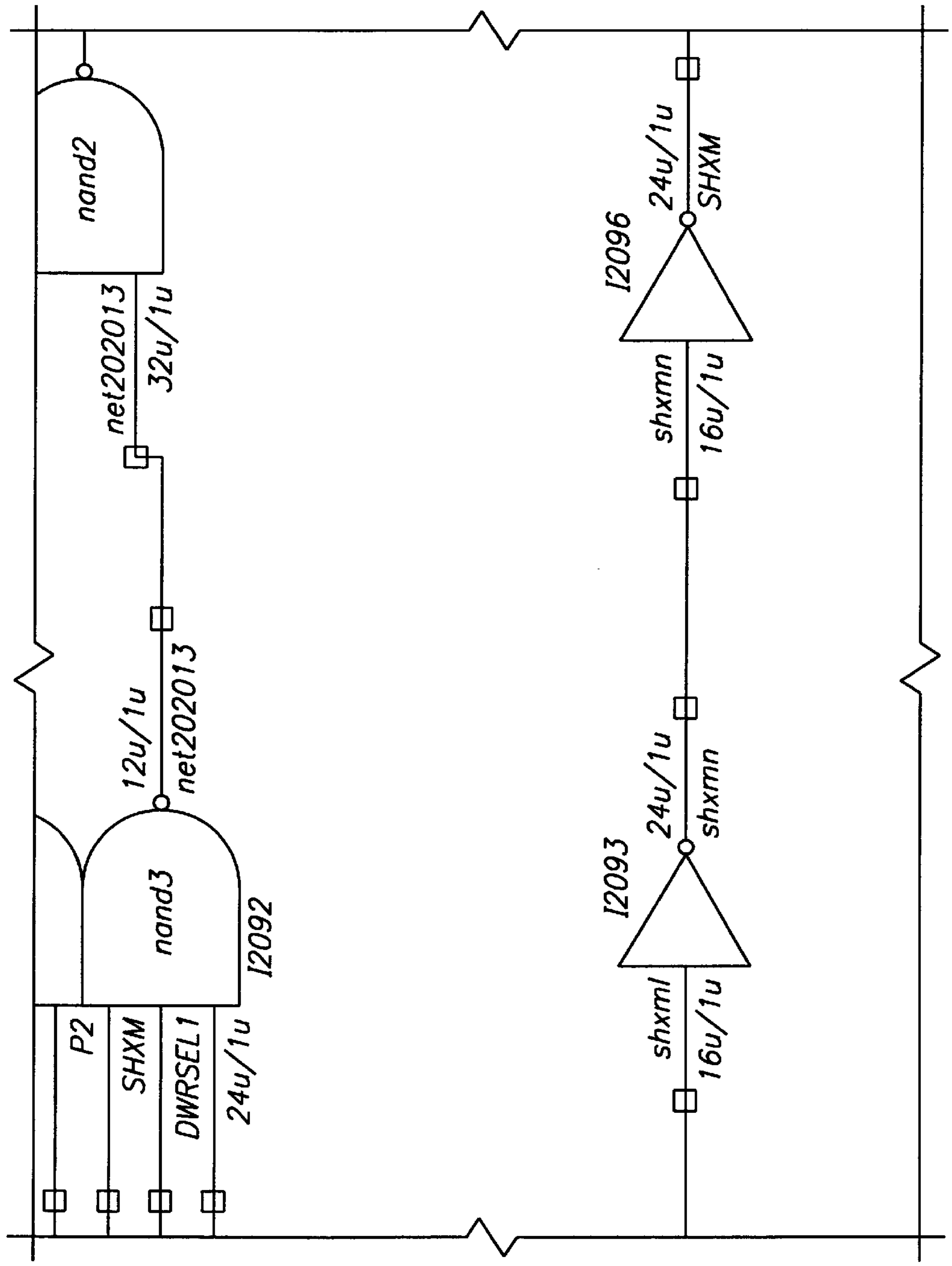
FIG. 7.0060.4CH

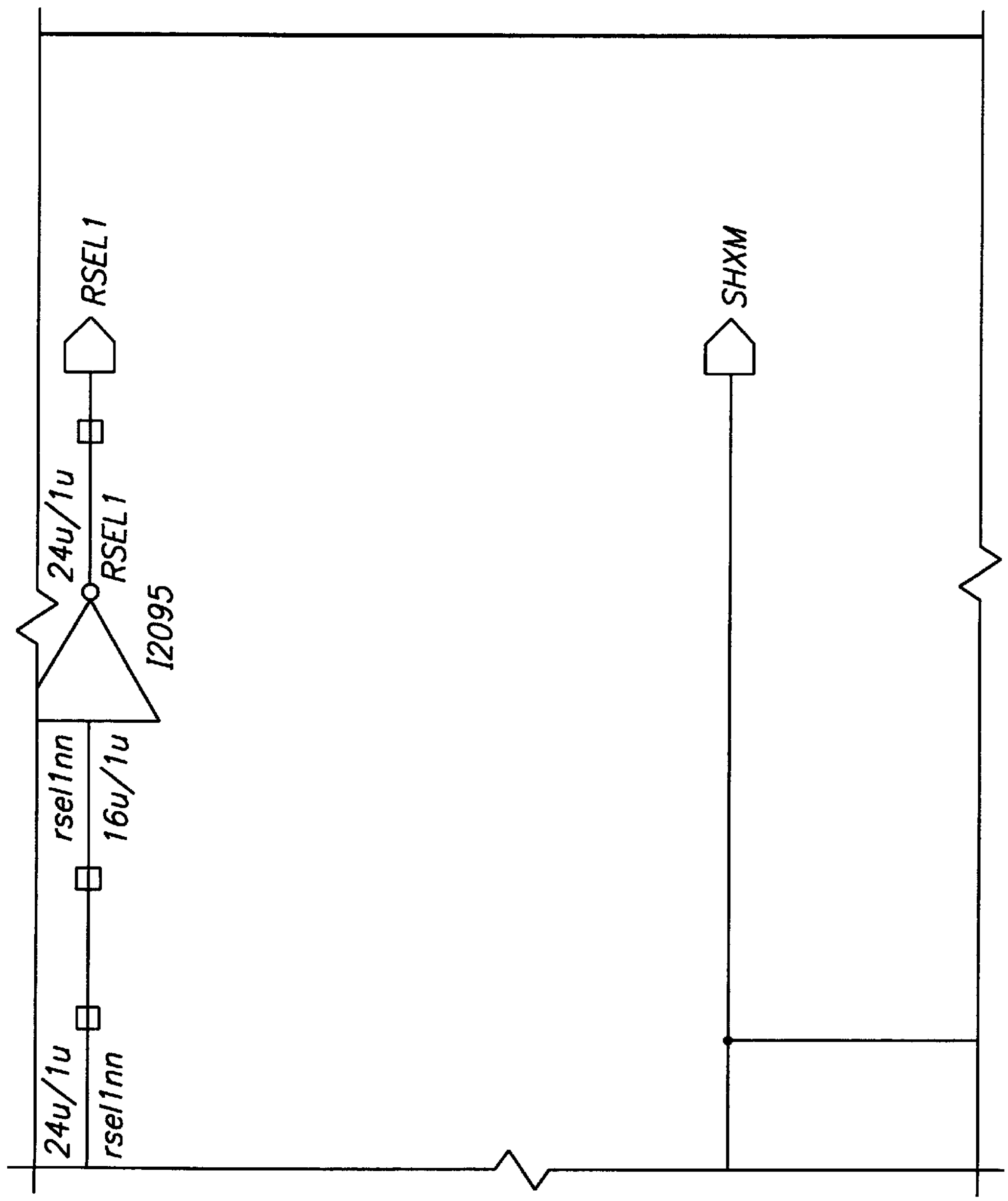
FIG. 7.0604CC

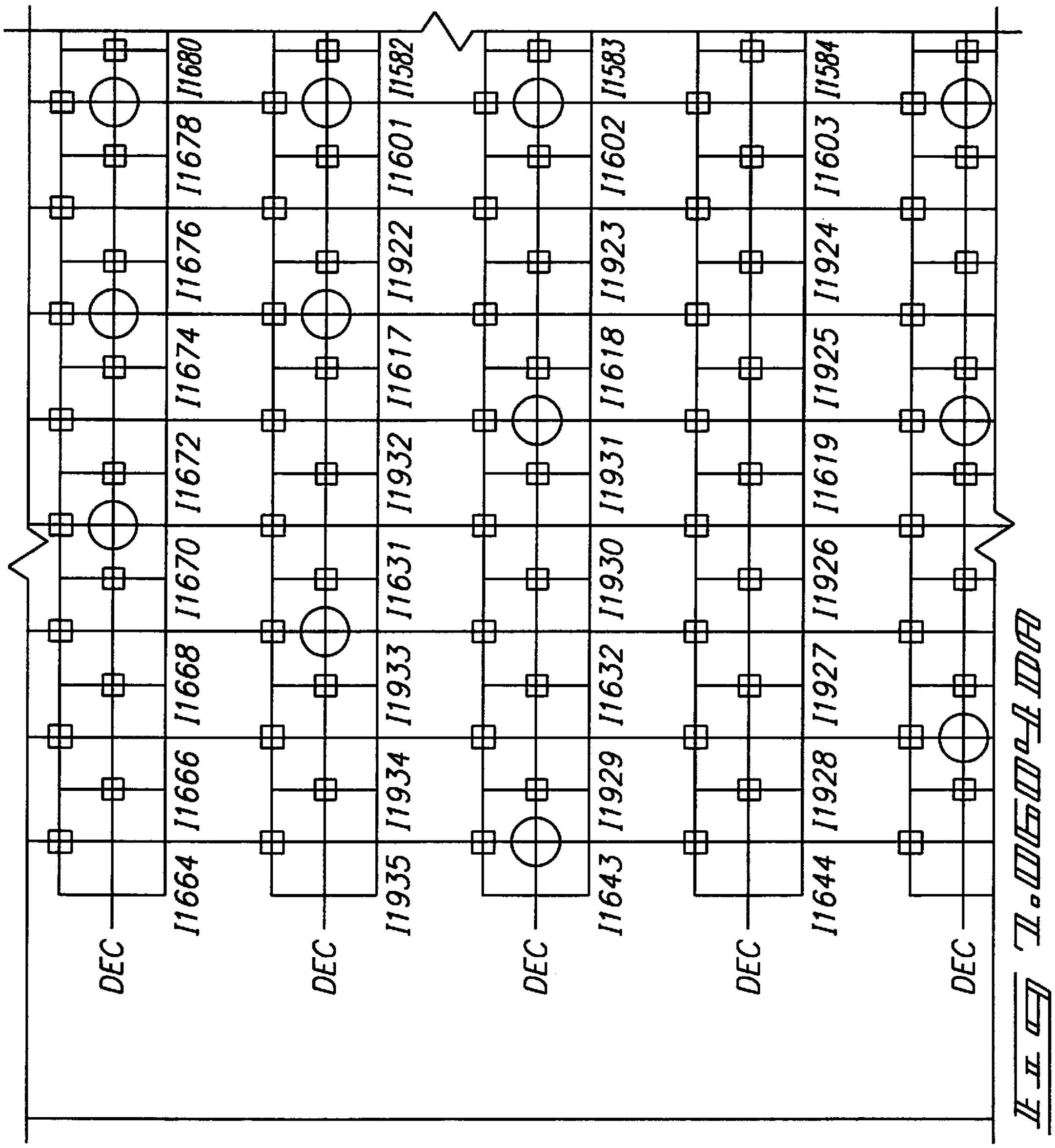
FIG. 7.0690A

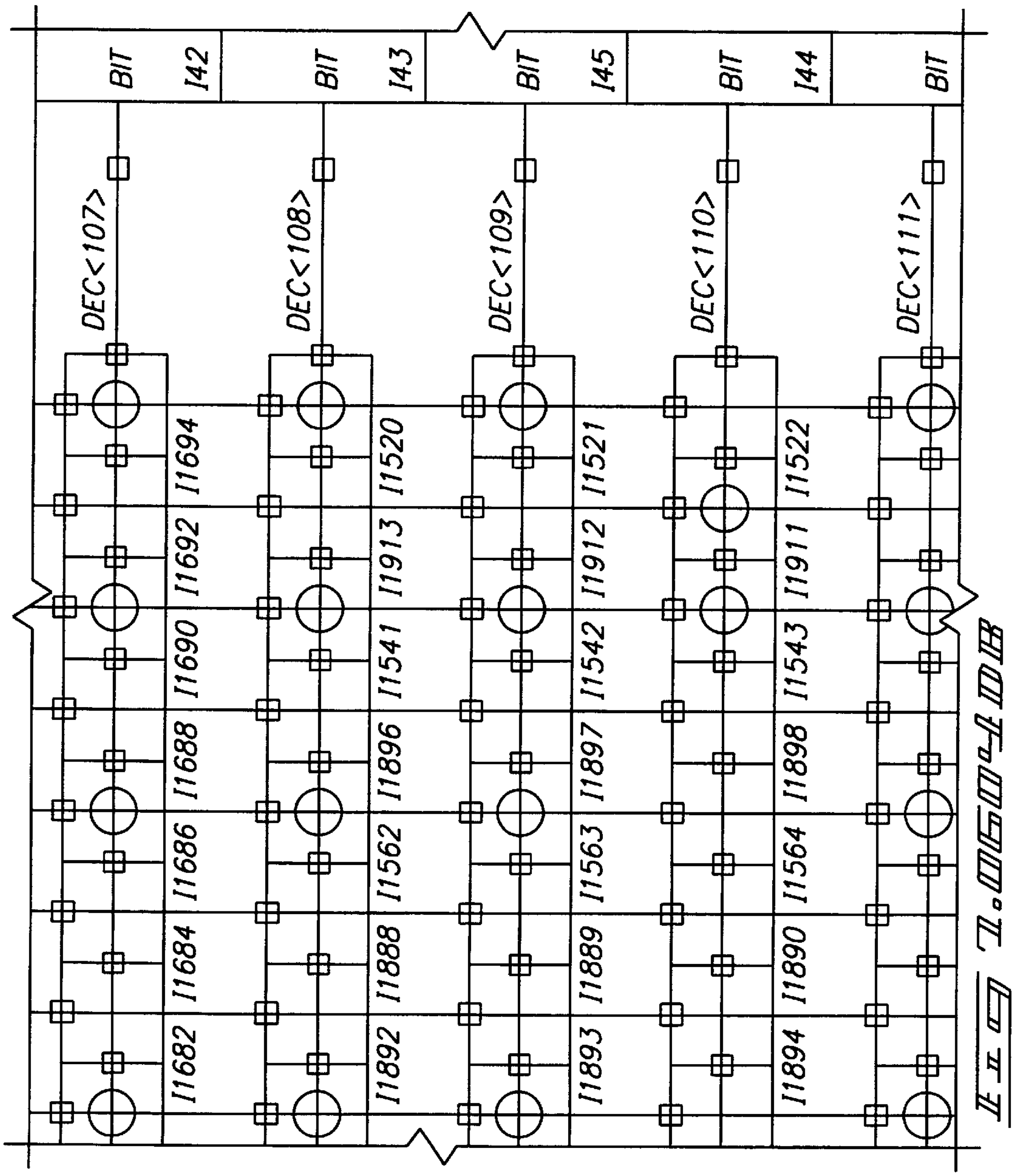
FIG. 1.060-4DB

FIG. 7.0604DC
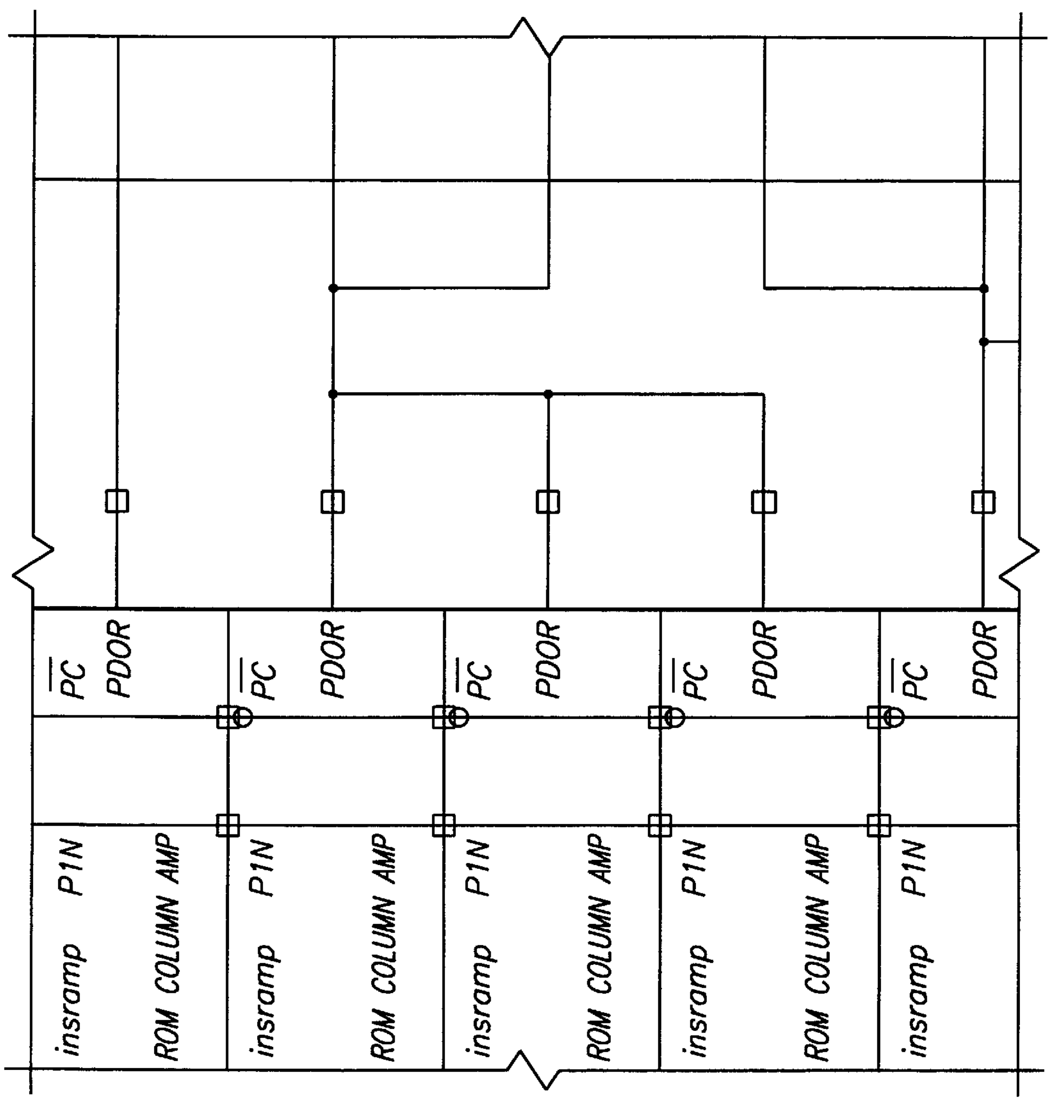

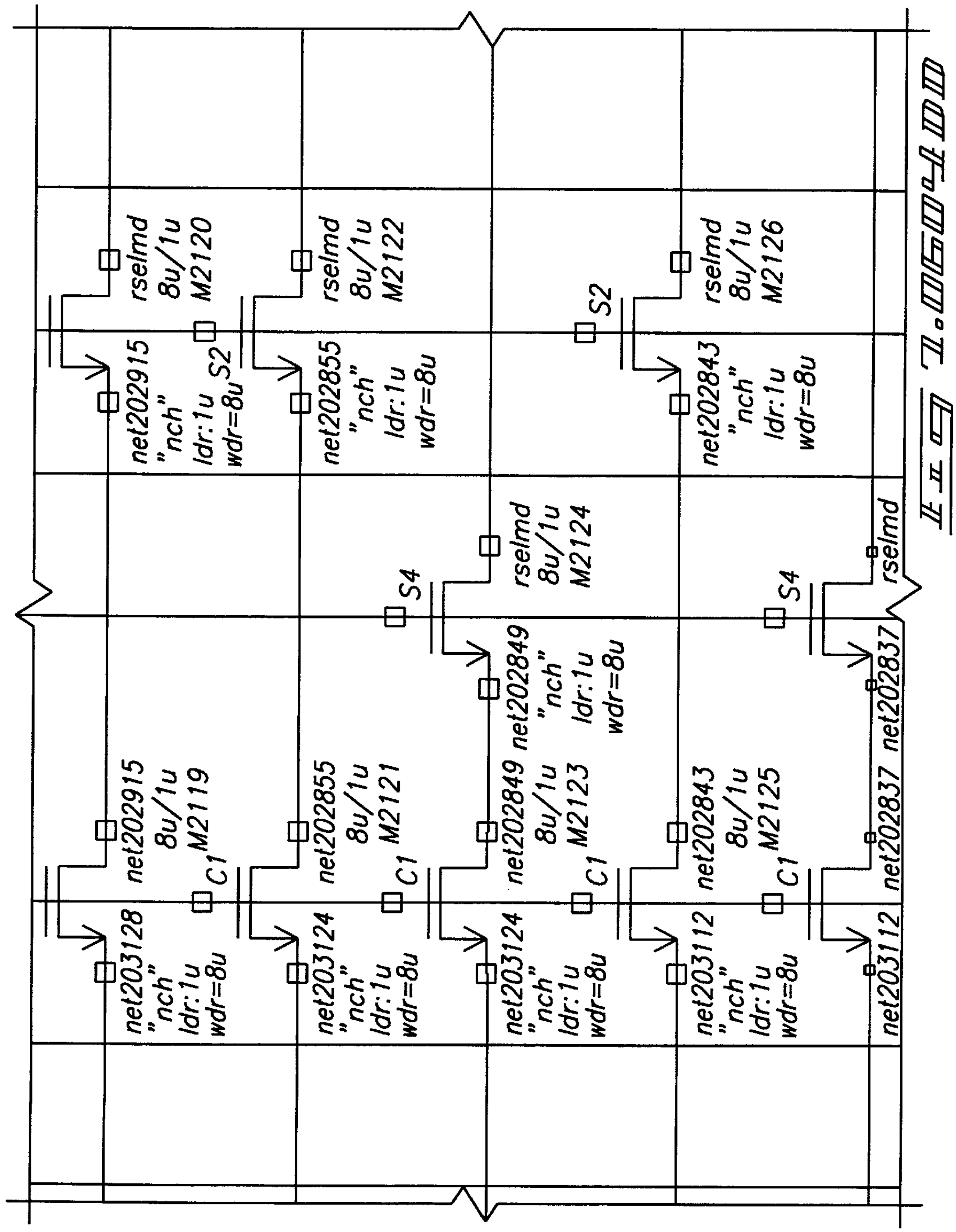
Fig. 7.060400

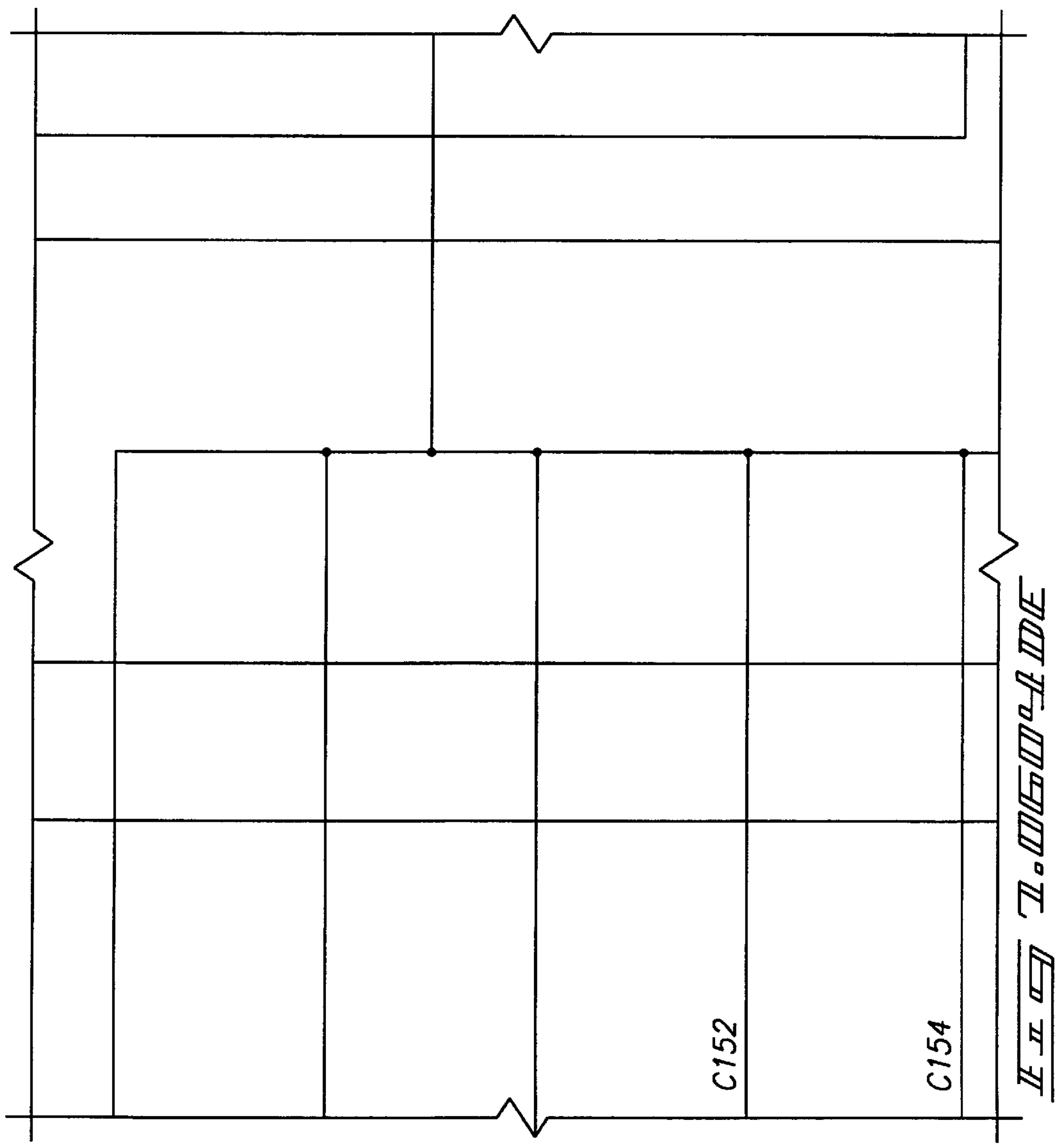
FIG. 1.0604DE

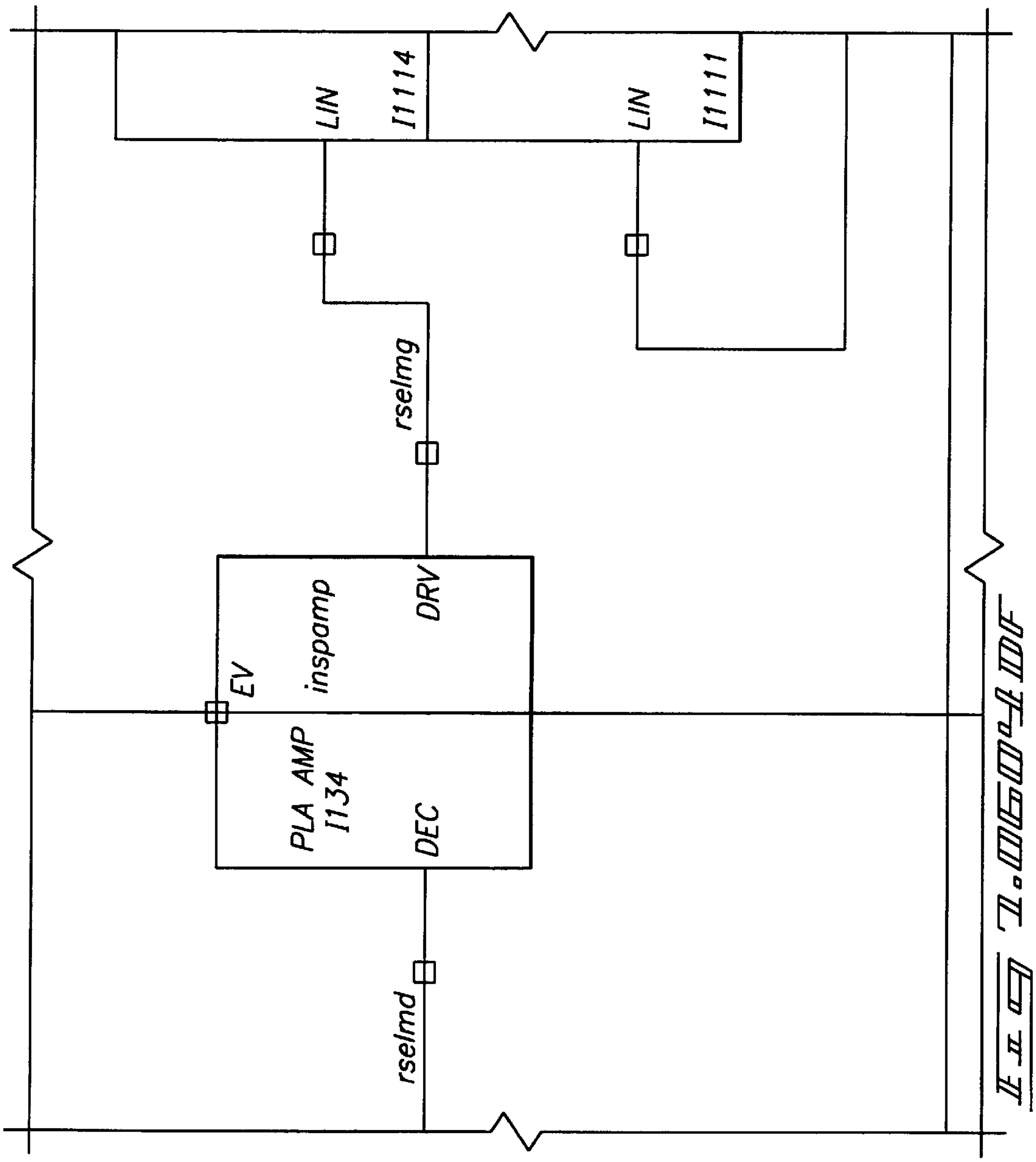
FIG. 7.060.4DF

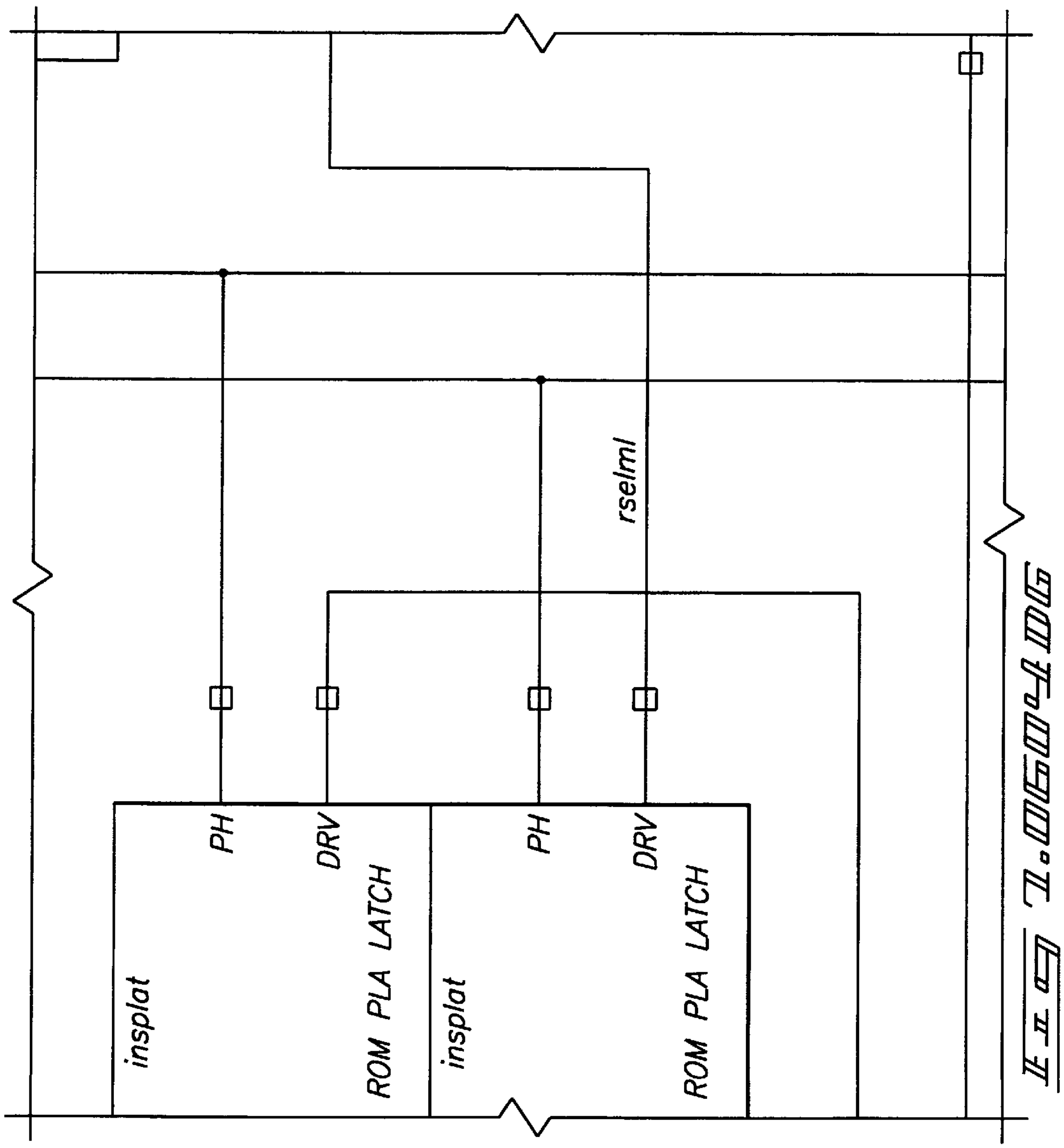
Fig. 7.060.4DG

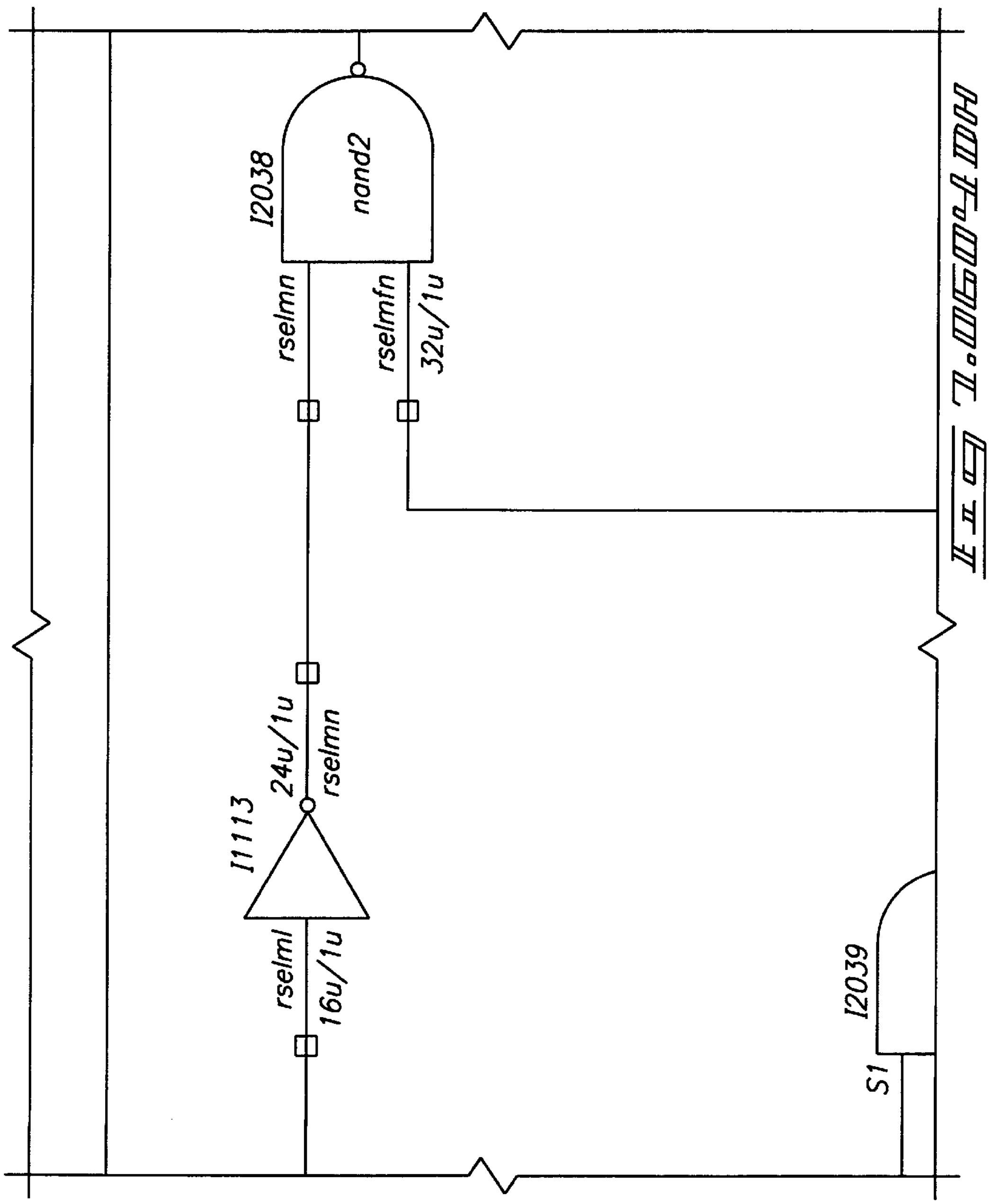
Fig. 7.0690.4DH

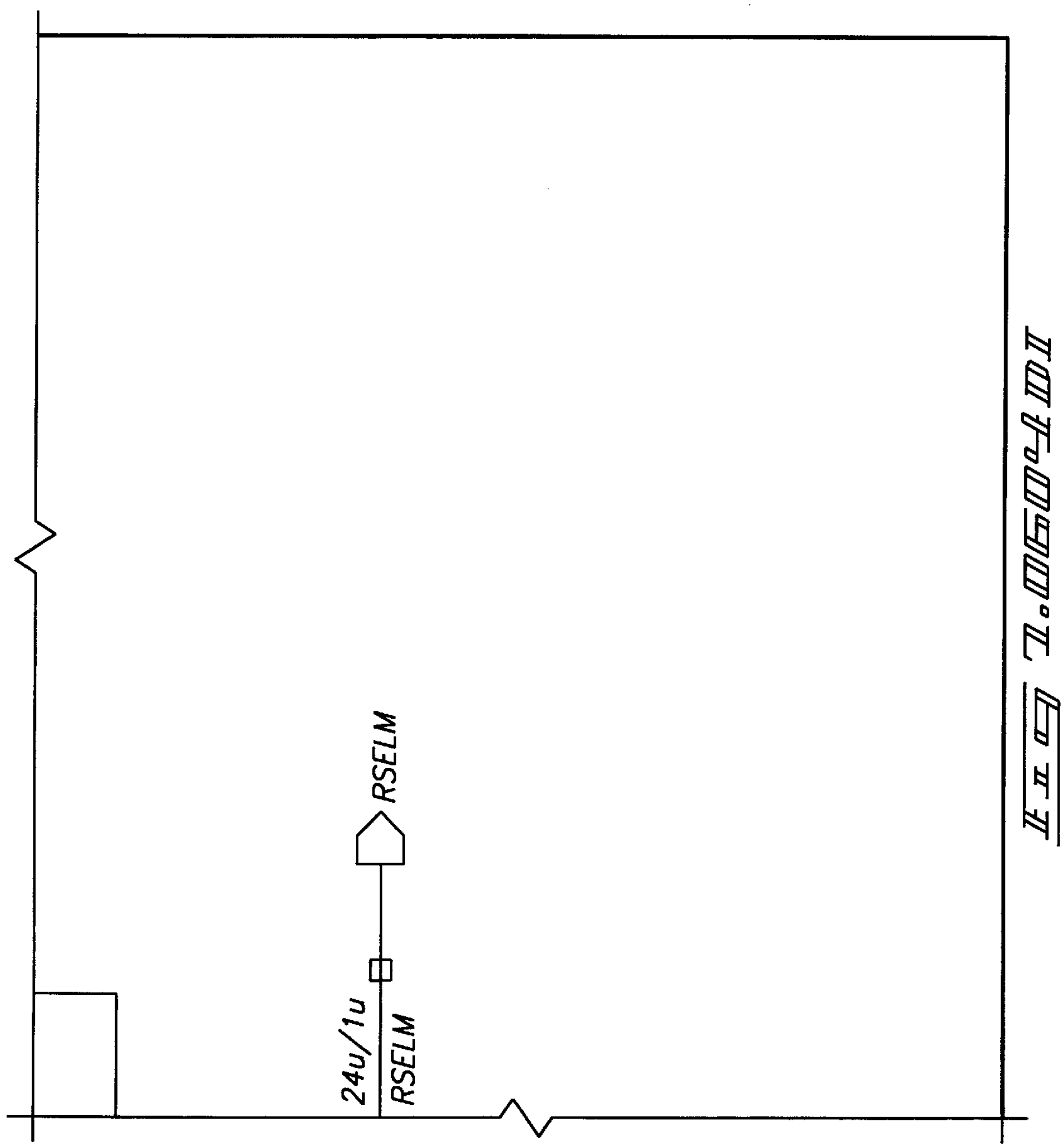
FIG. 7.060AD1

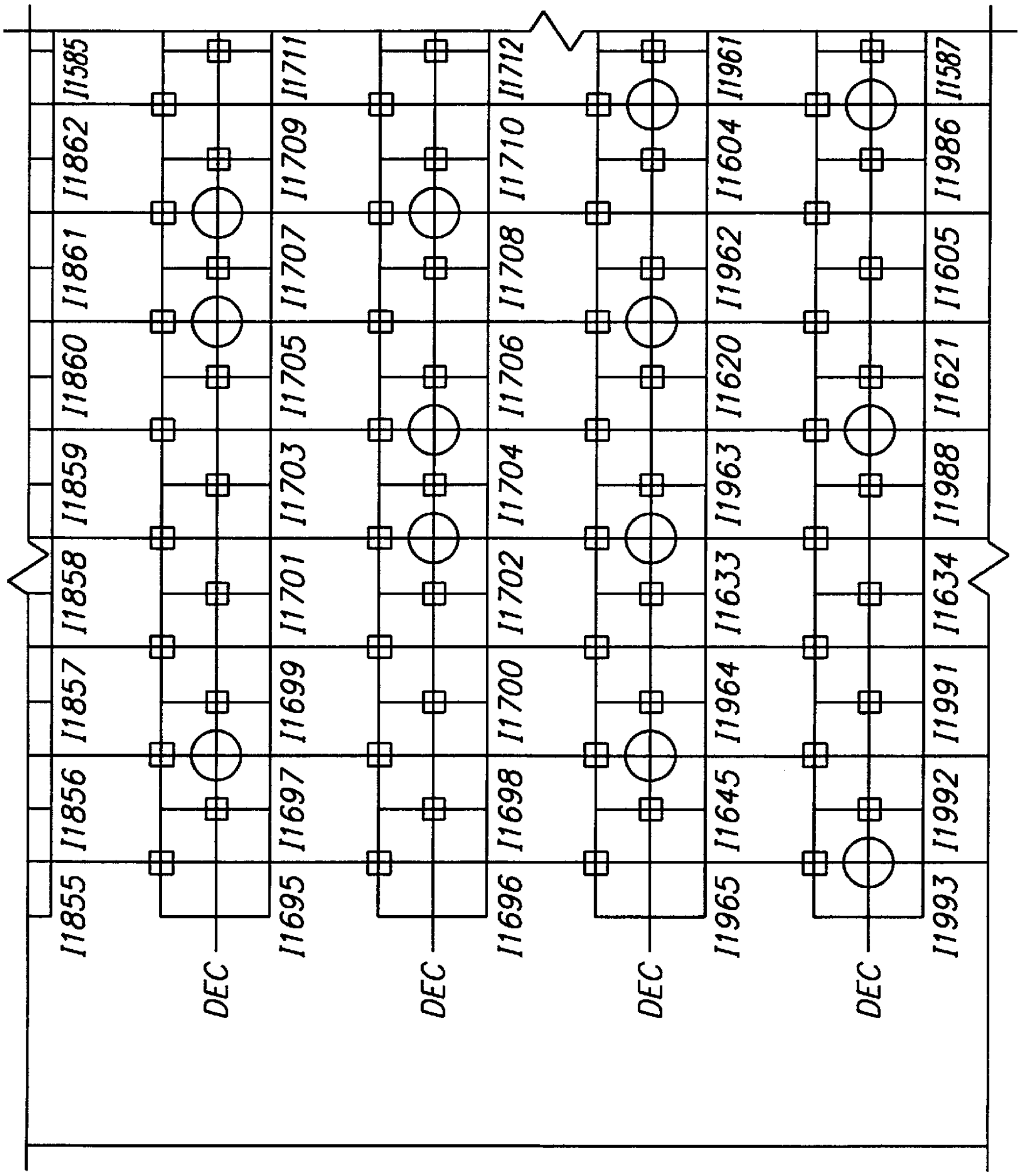
FIG. 1.0604EA

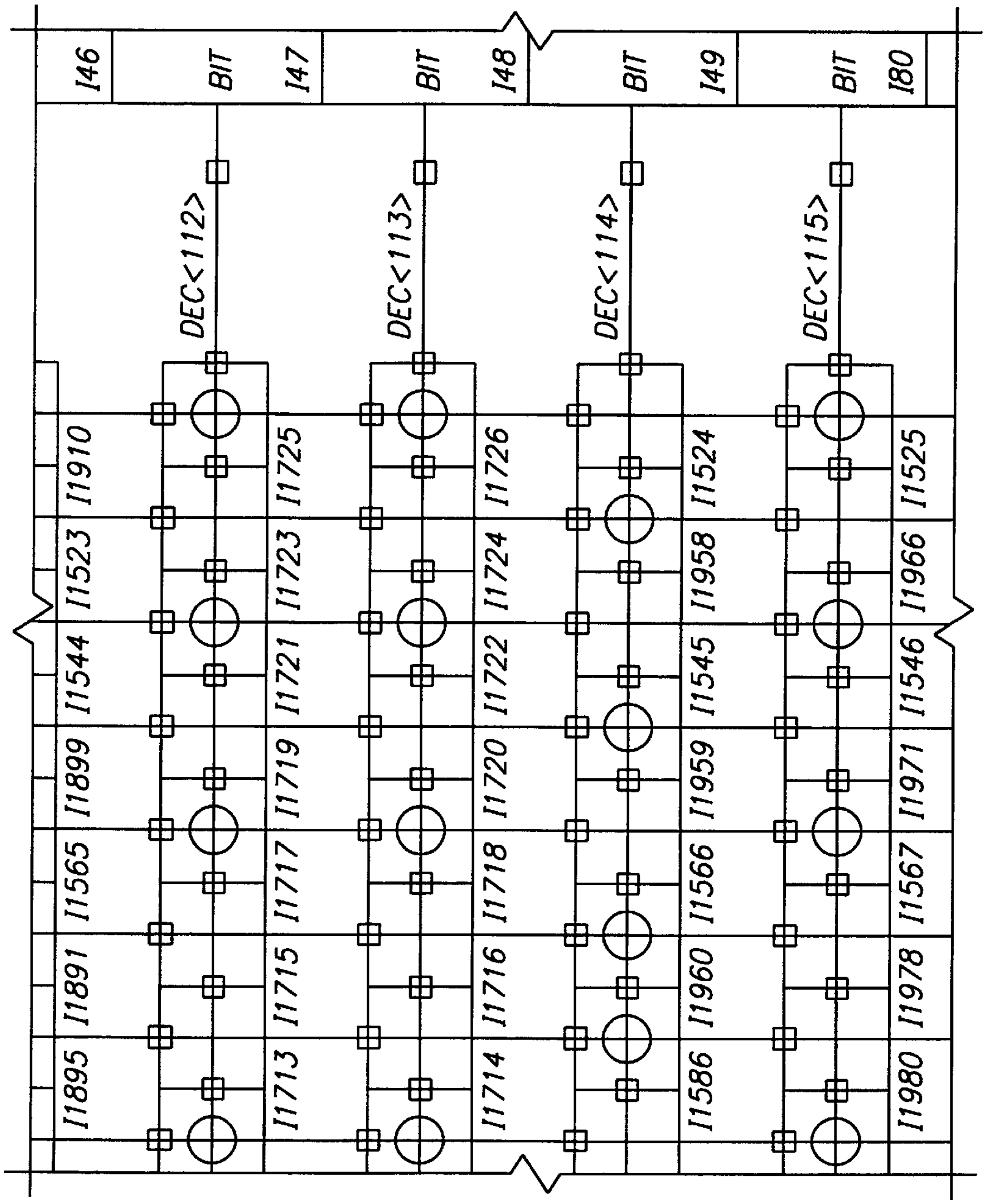
FIG. 1.0604EB

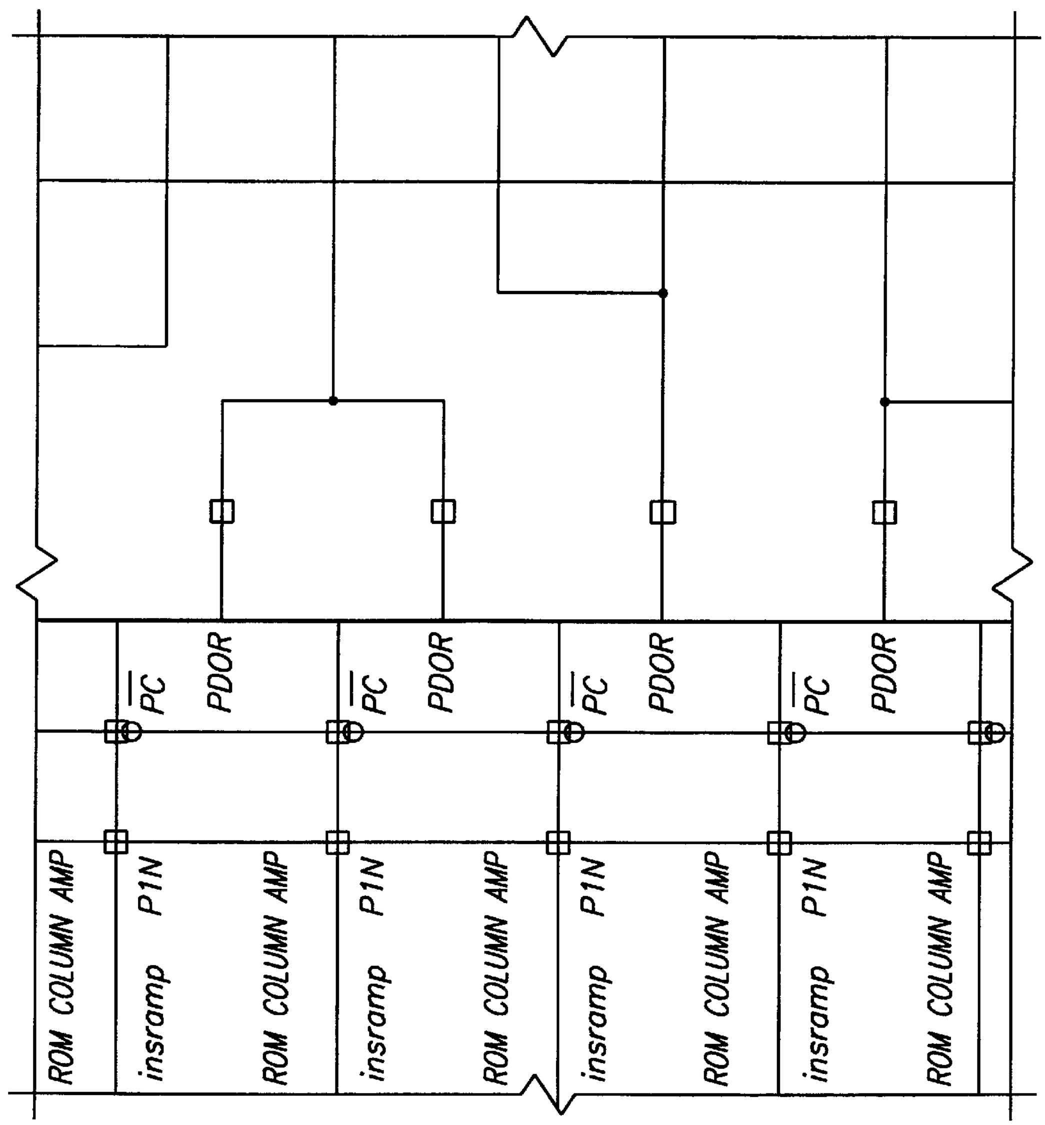
FIG. 7.060.4EC

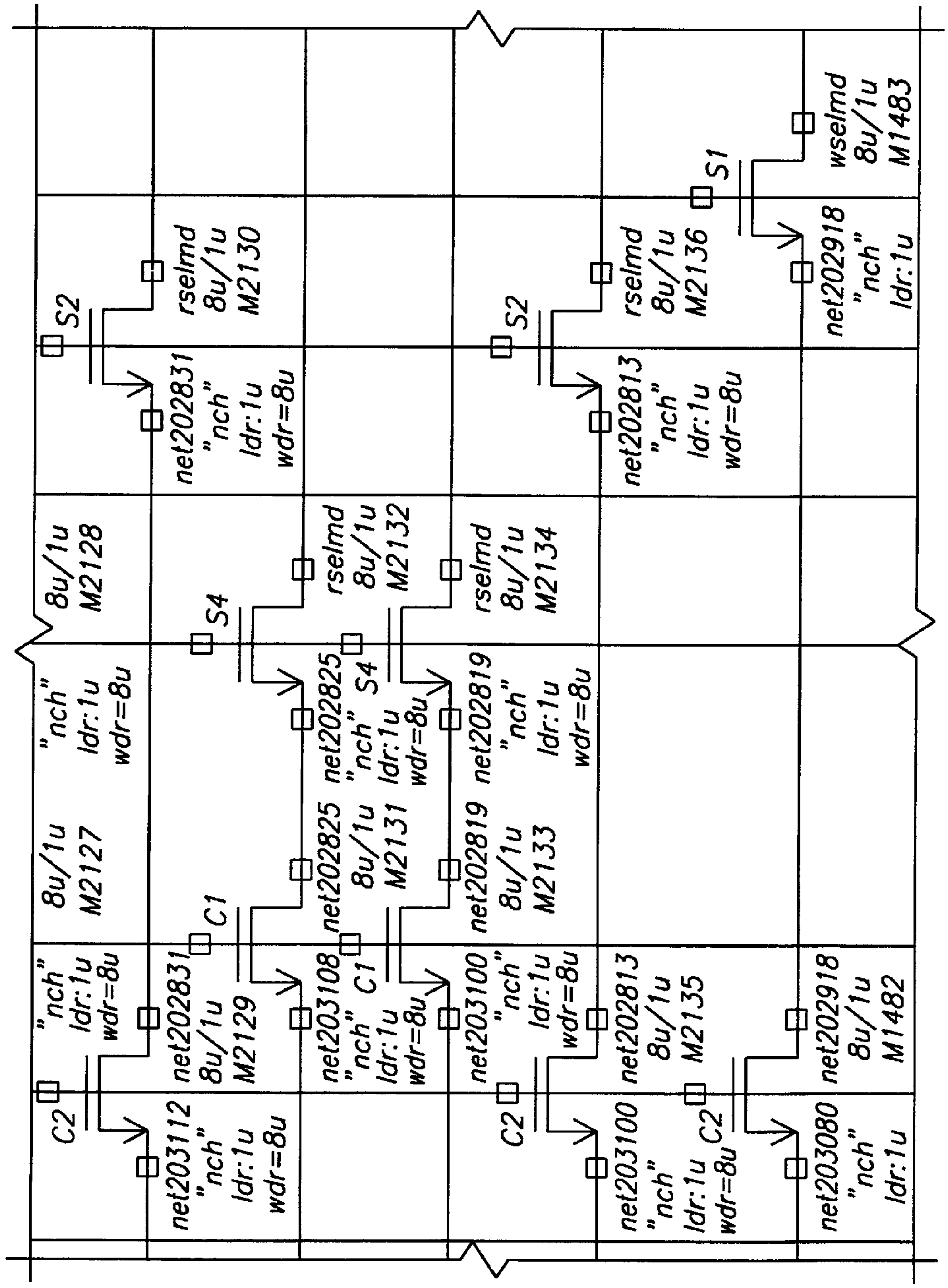
FIG. 7.060.4ED

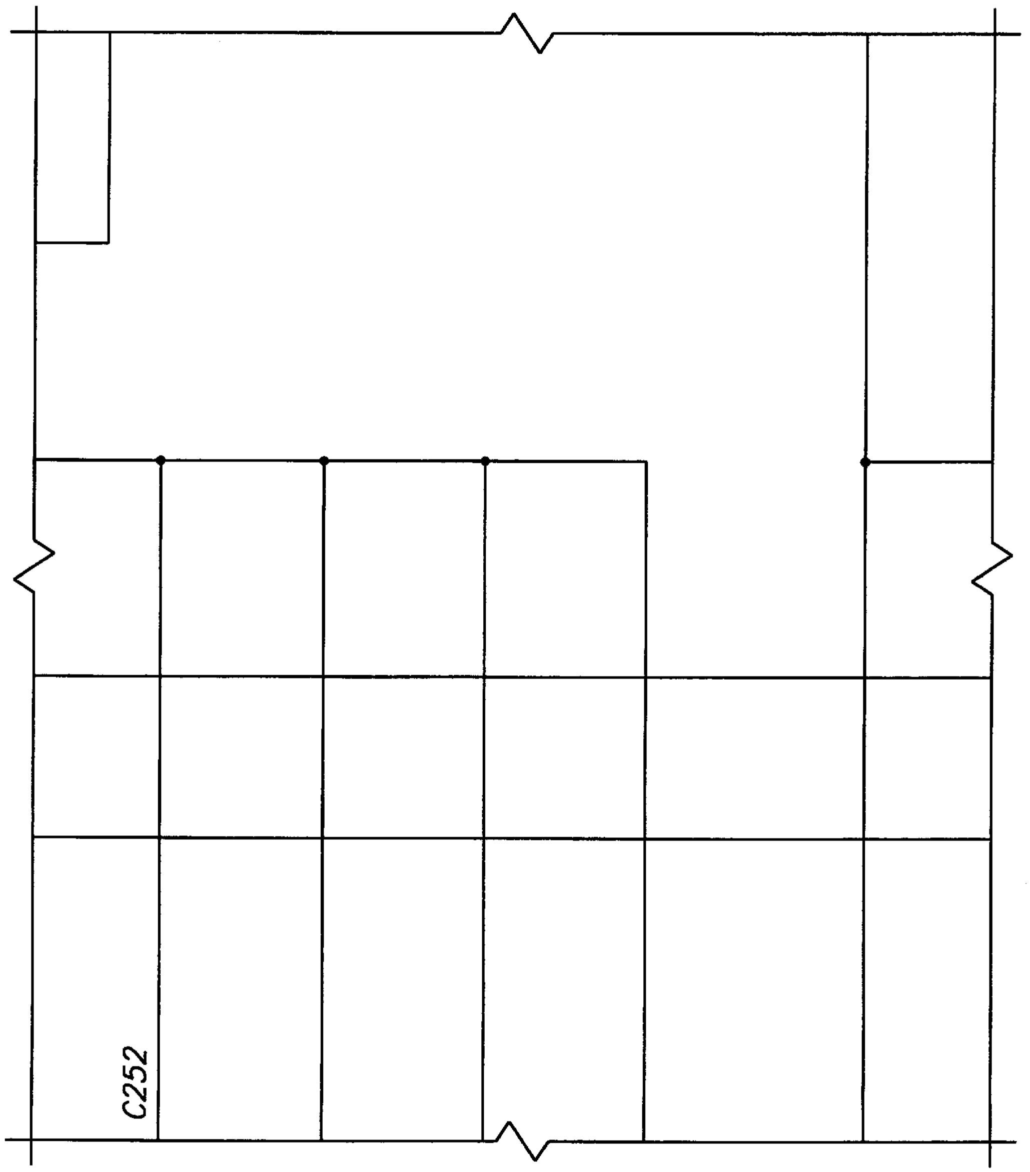
FIG. 7.0604EE

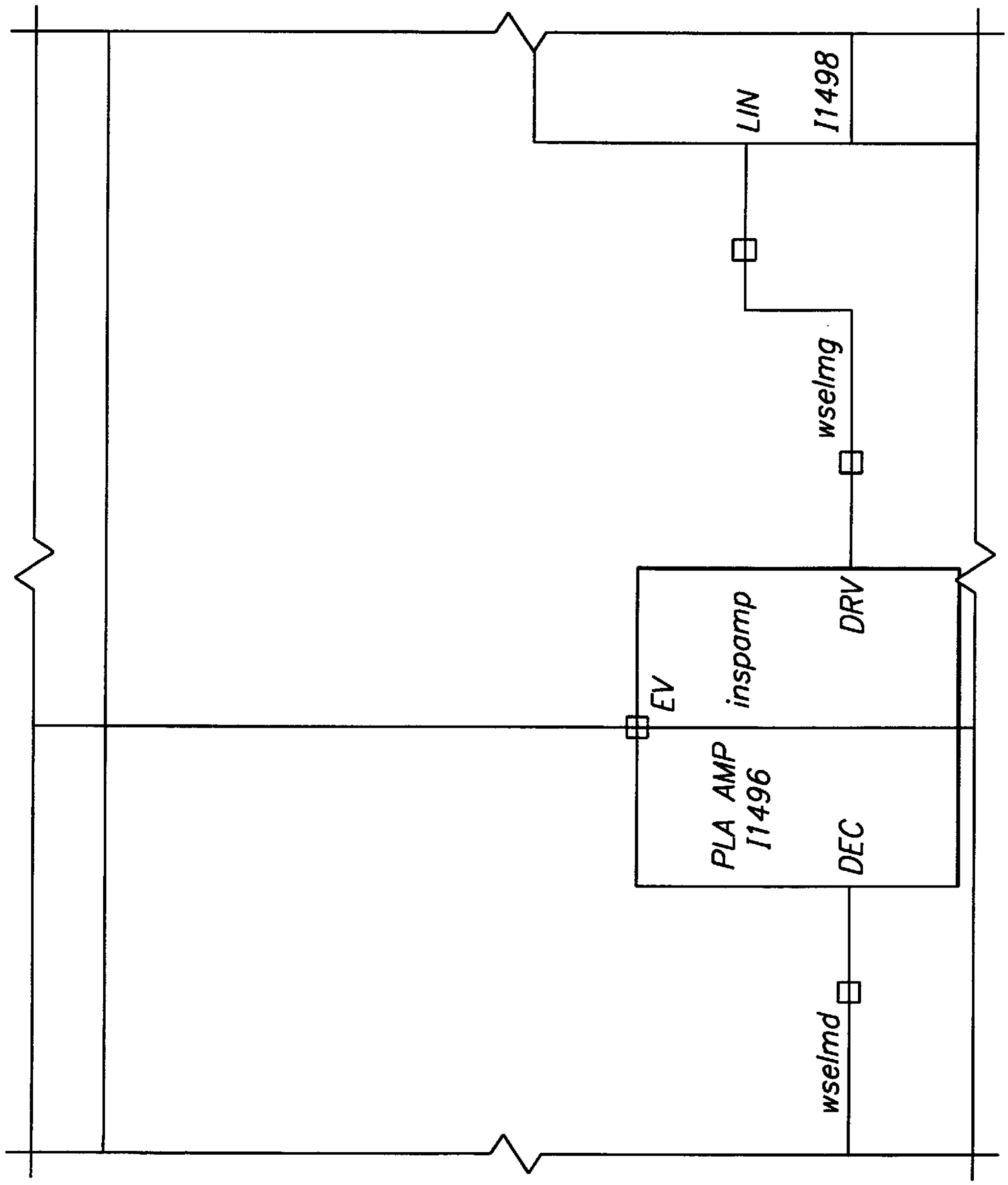
Fig. 1.0604EF

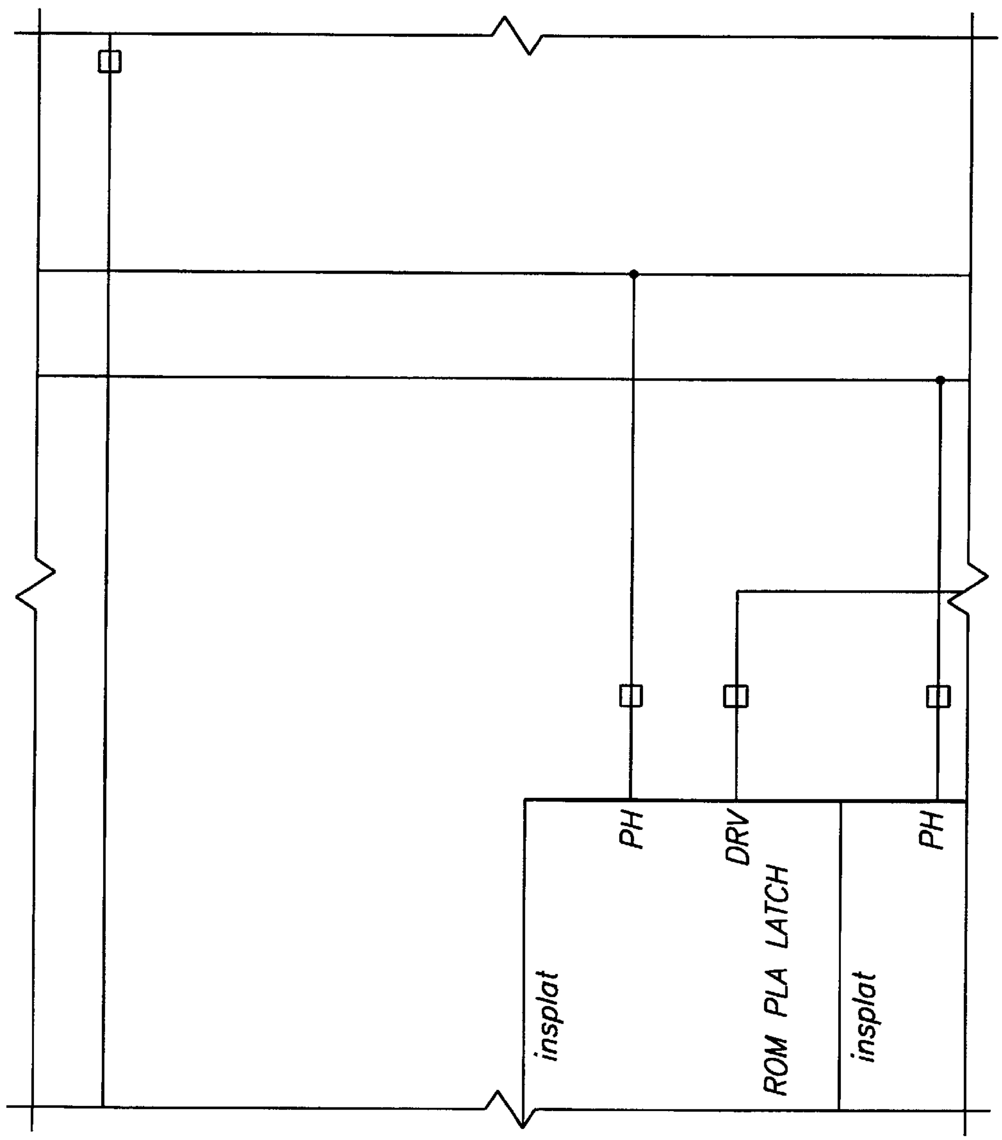
Fig. 7.0604E6

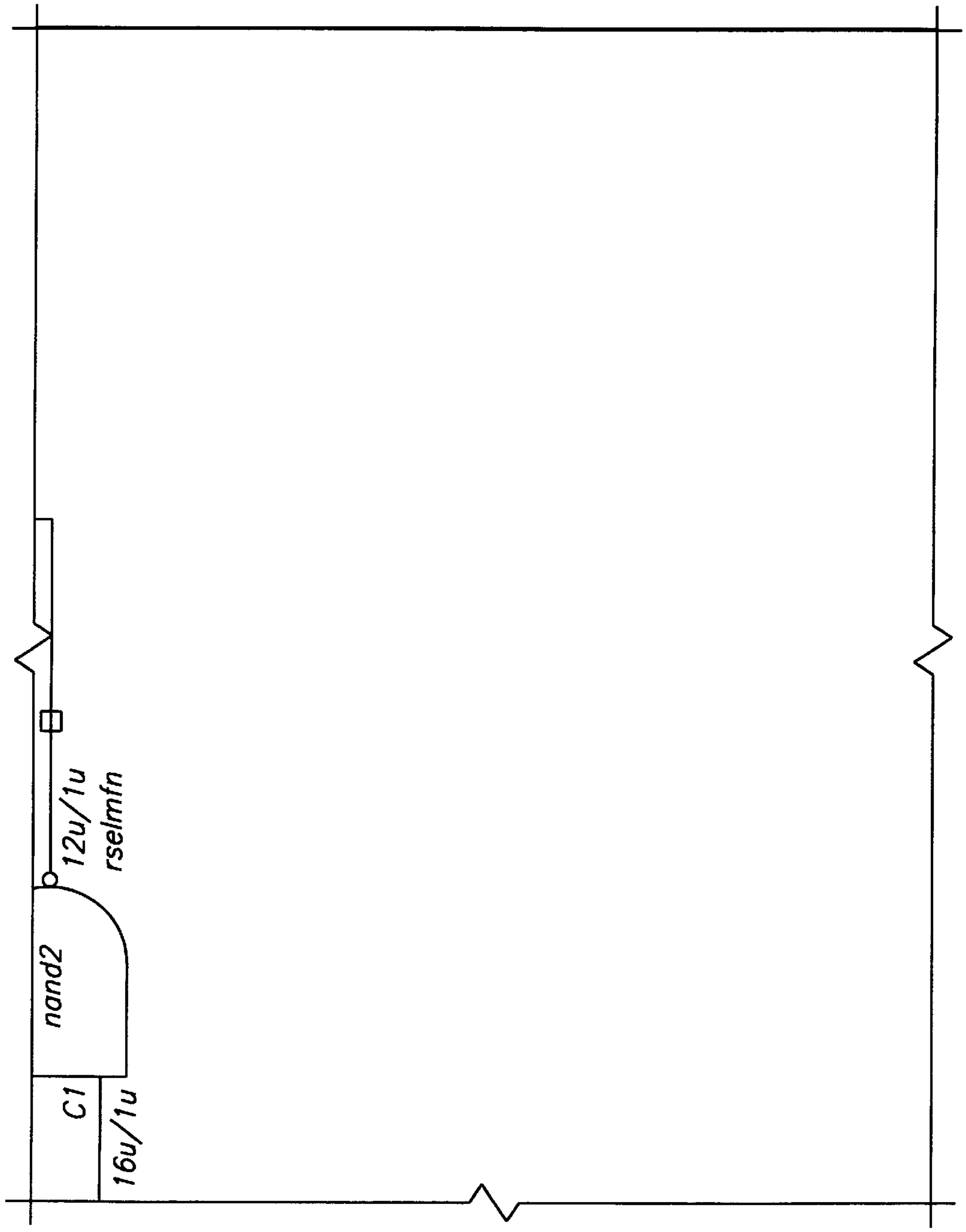
Fig. 7.0604EH

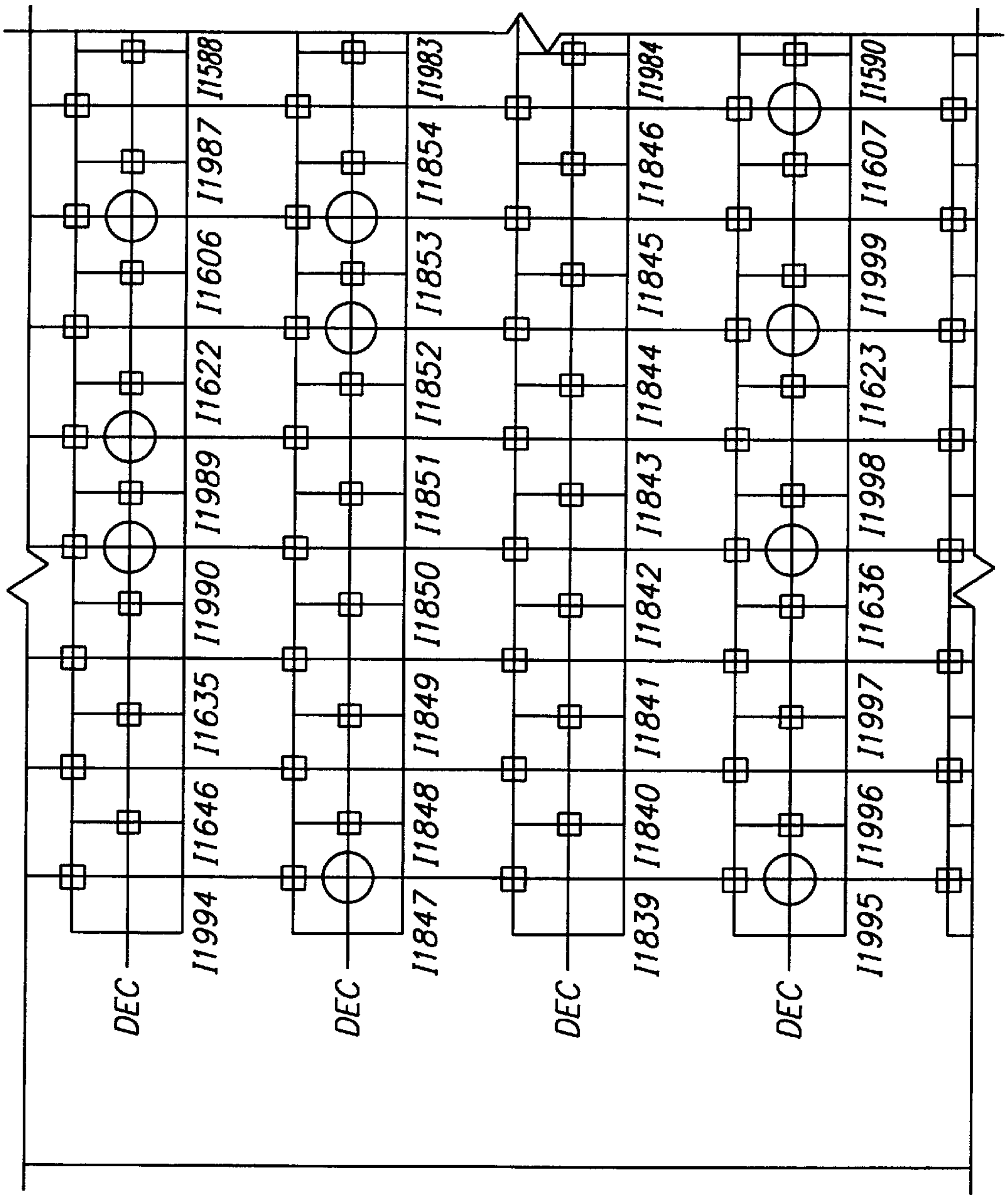
Fig. 7.0604FA

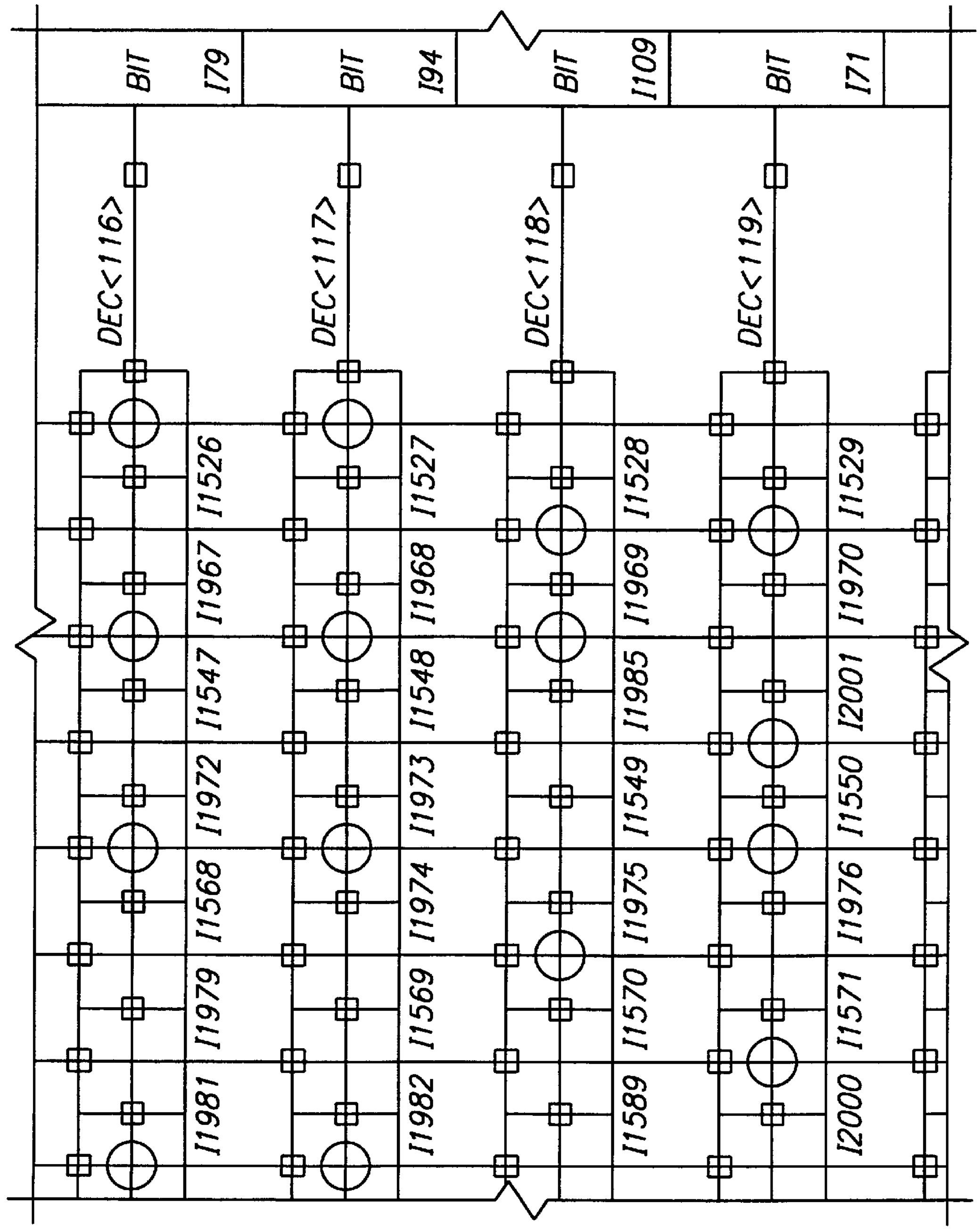
Fig. 1.0604FB

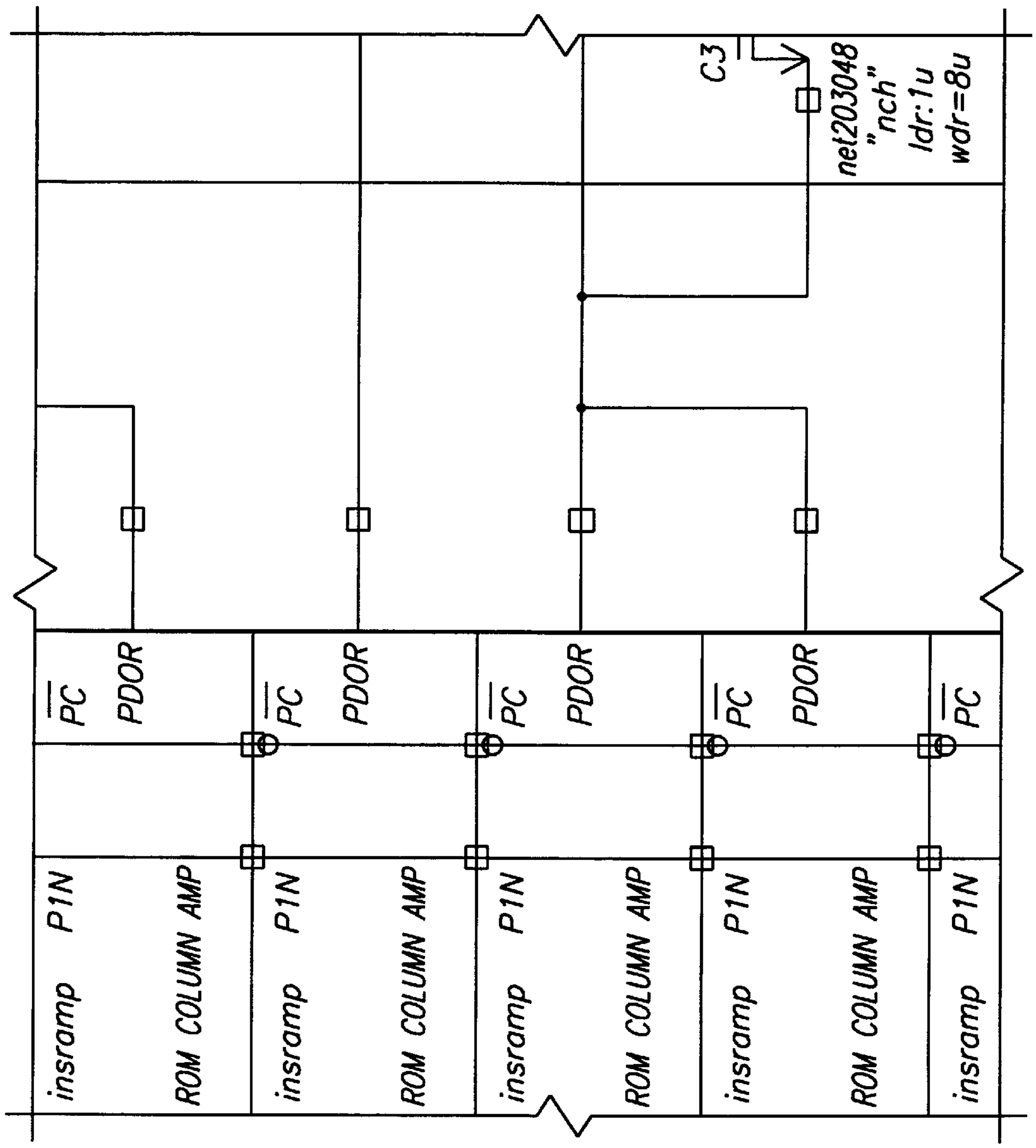
FIG. 7.0604FC

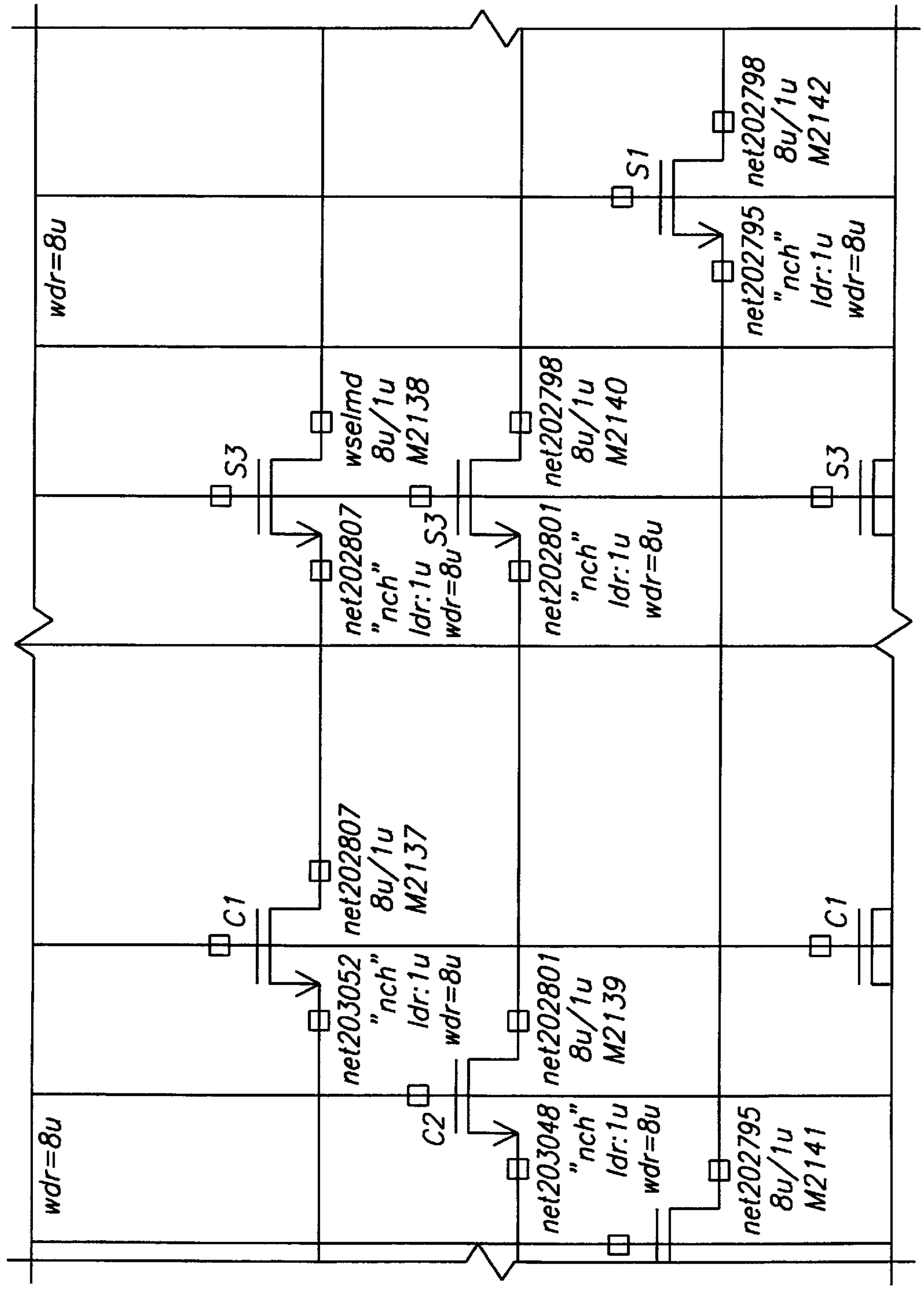
FIG. 7.060AFD

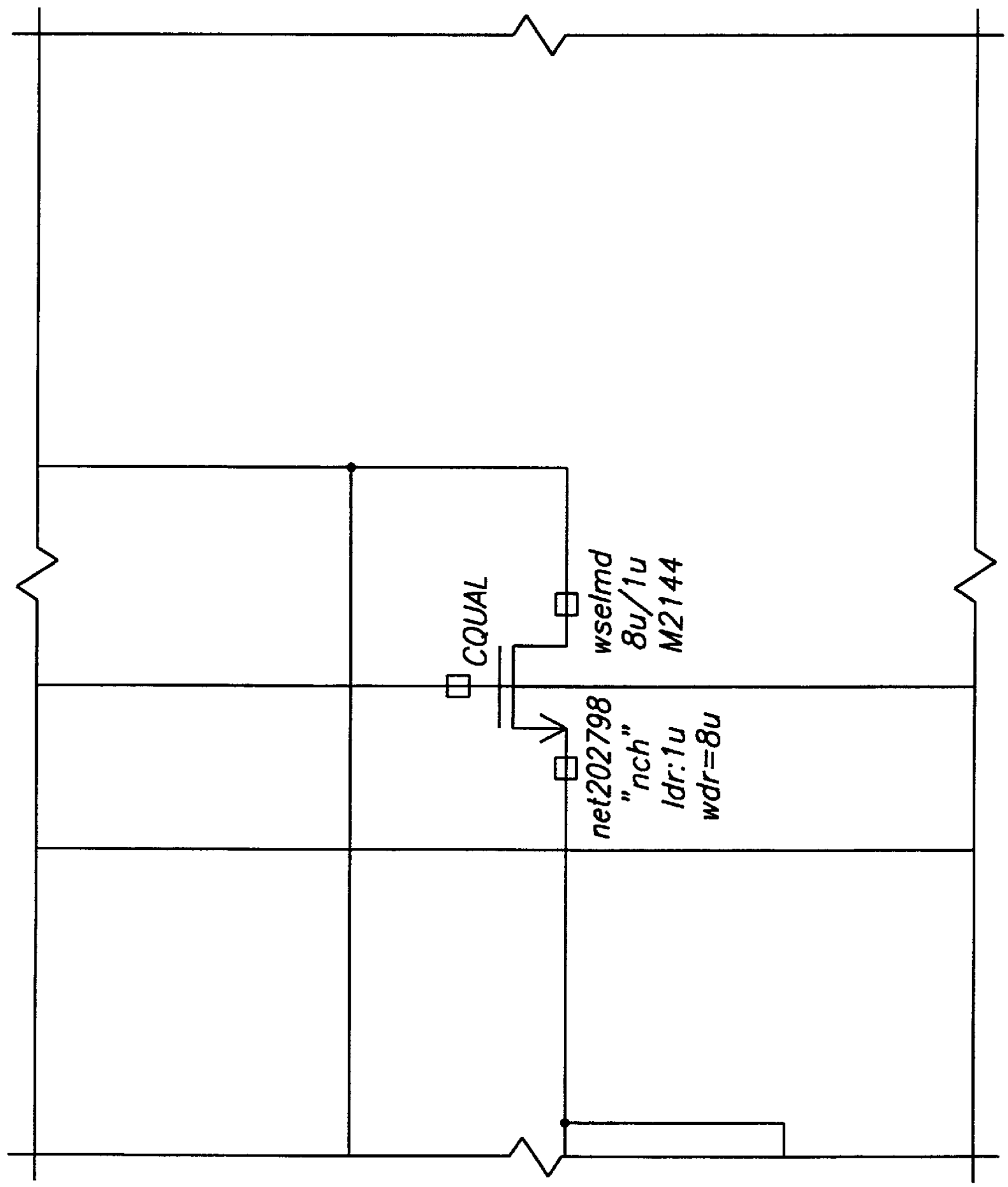
FIG. 7.060.4FE

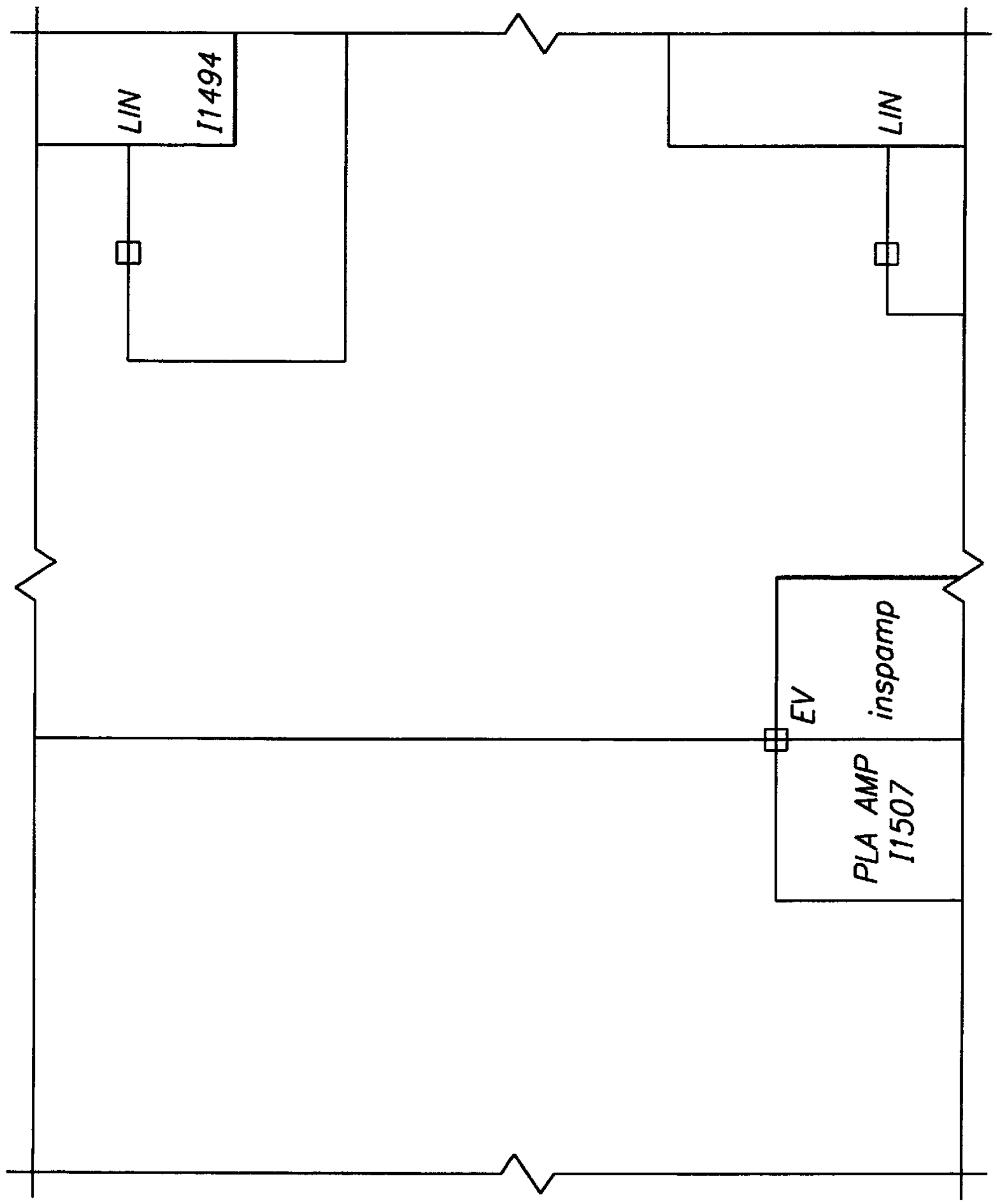
FIG. 7.060AFF

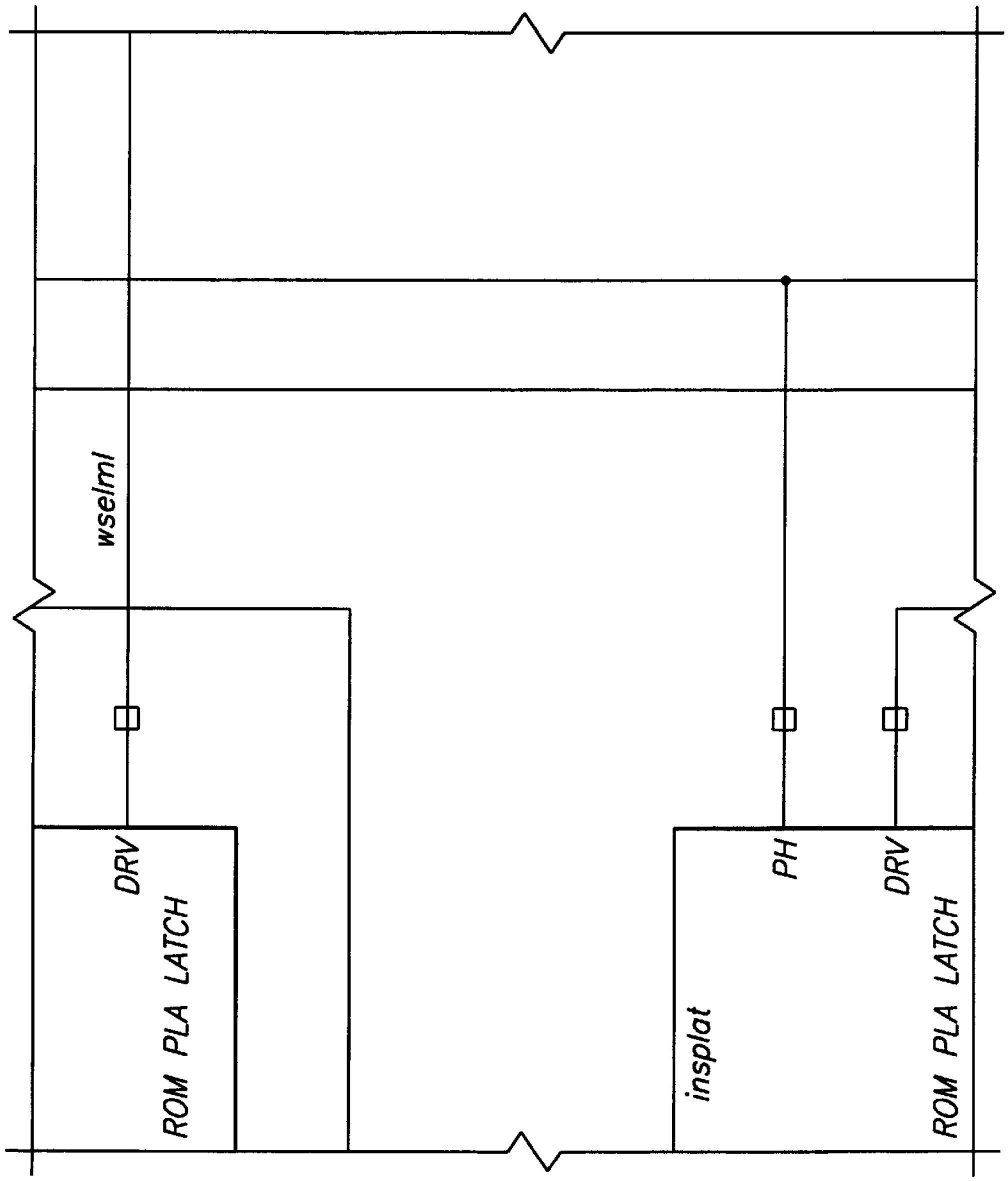
Fig 7.0604FG

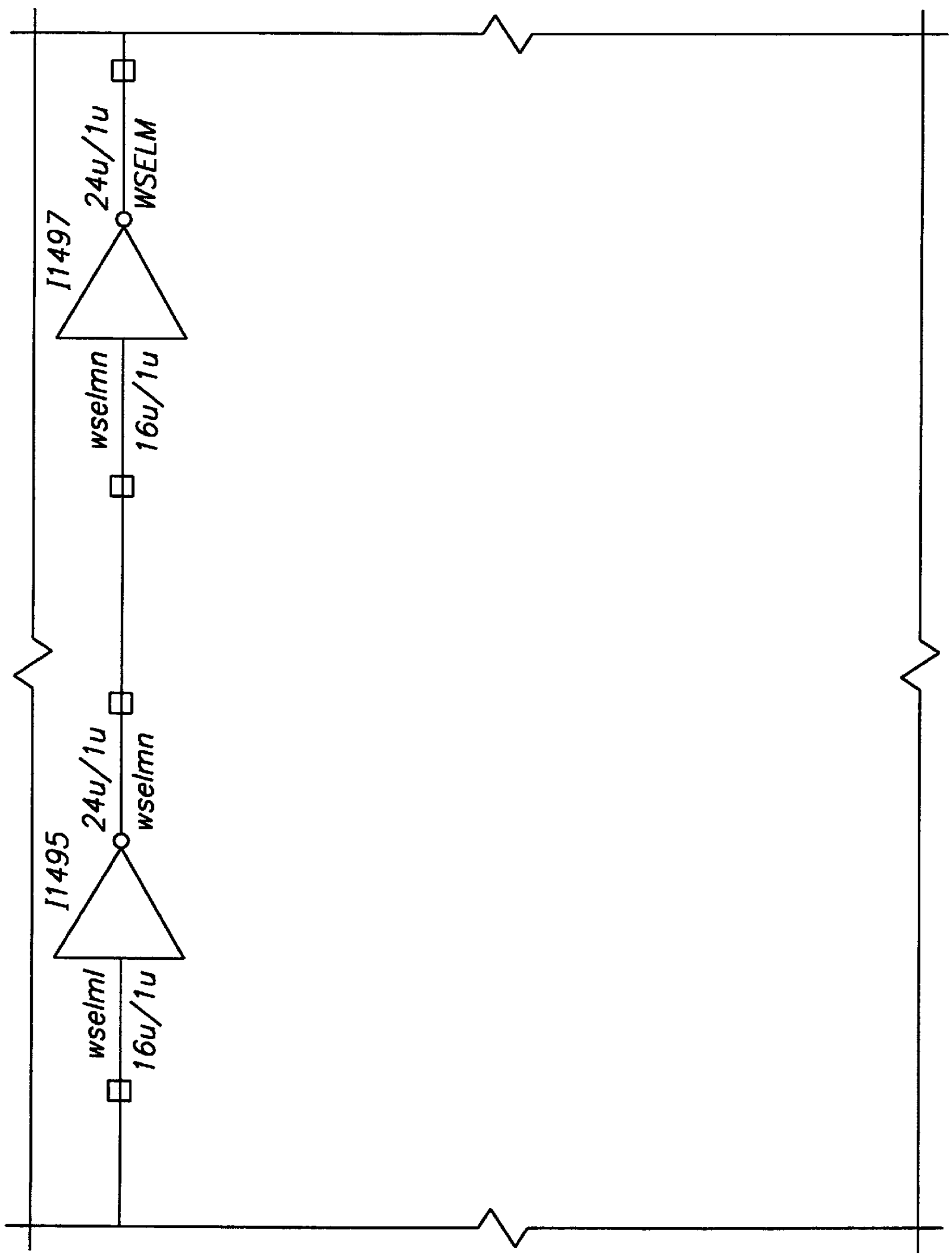
FIG. 7.060.4FH

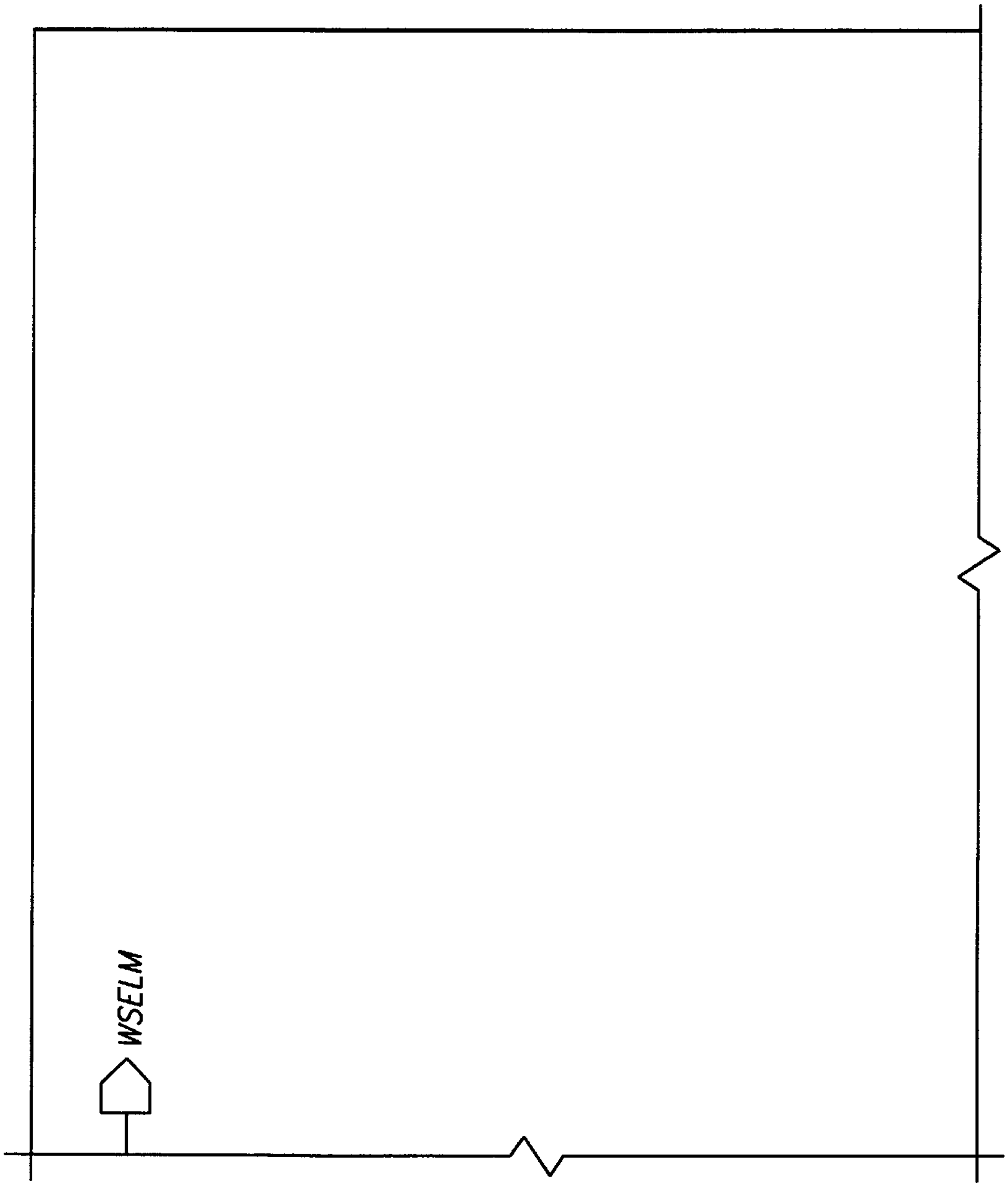
FIG. 7.0604F

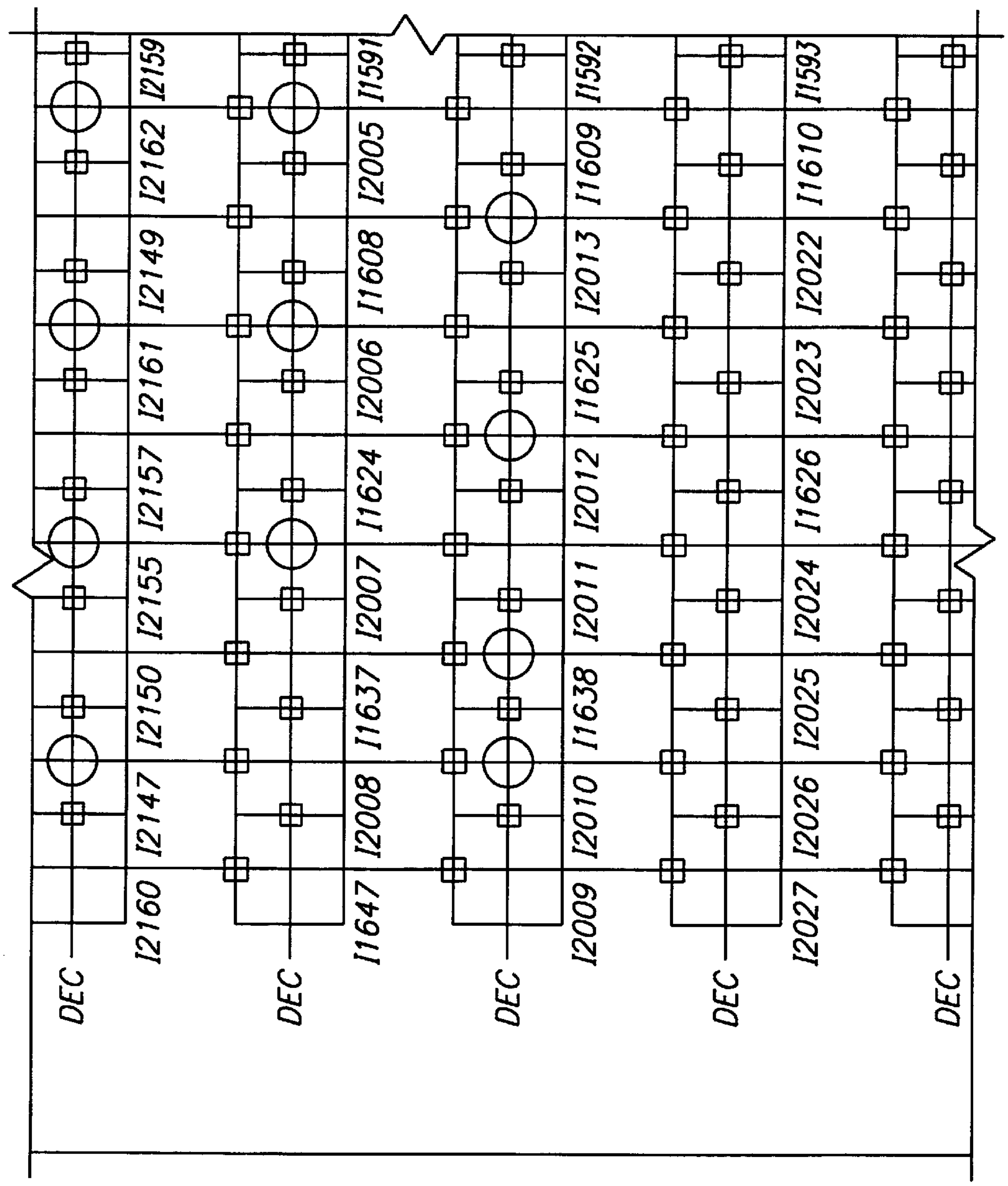
Fig. 7.0604GA

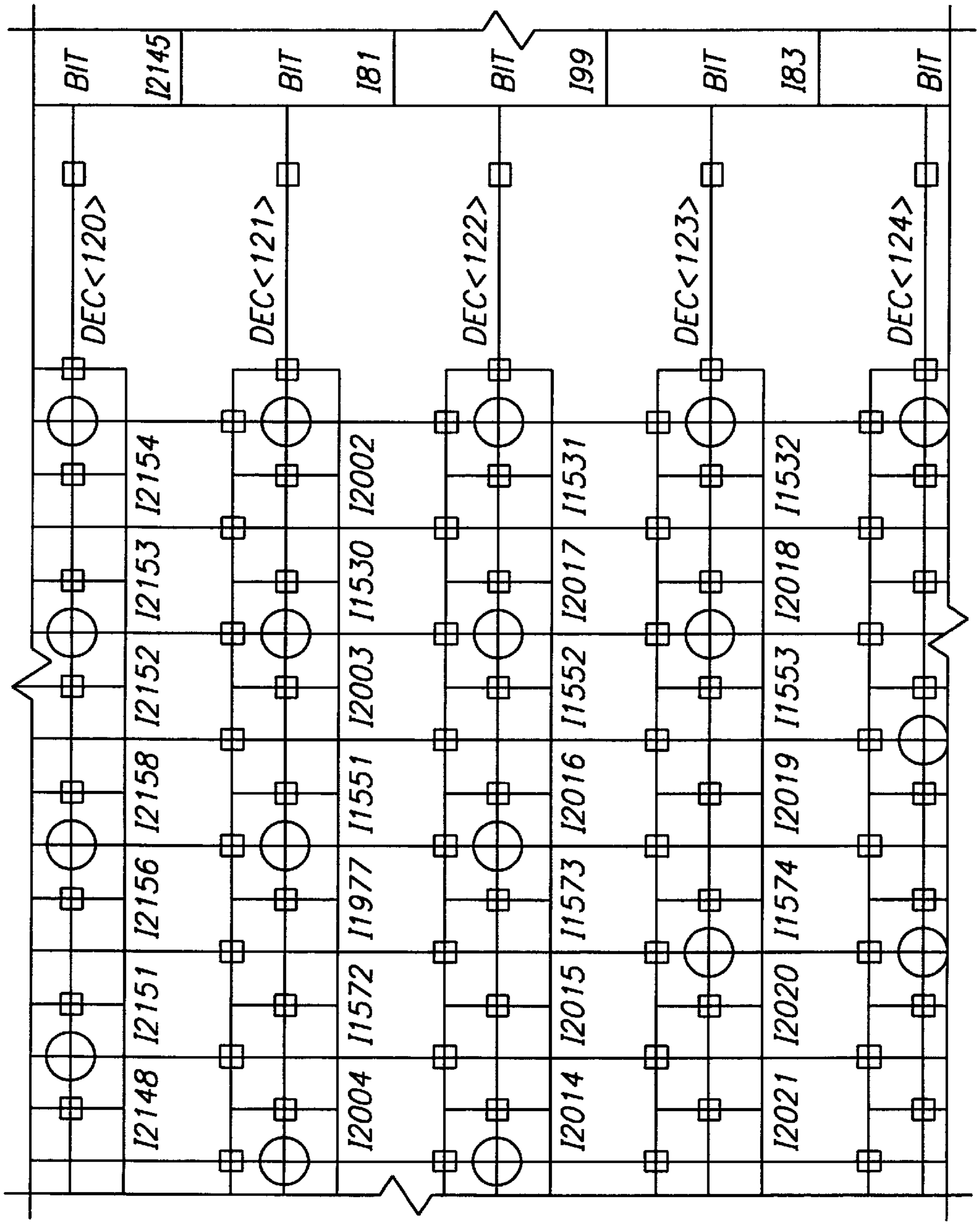
FIG. 7.0604GB

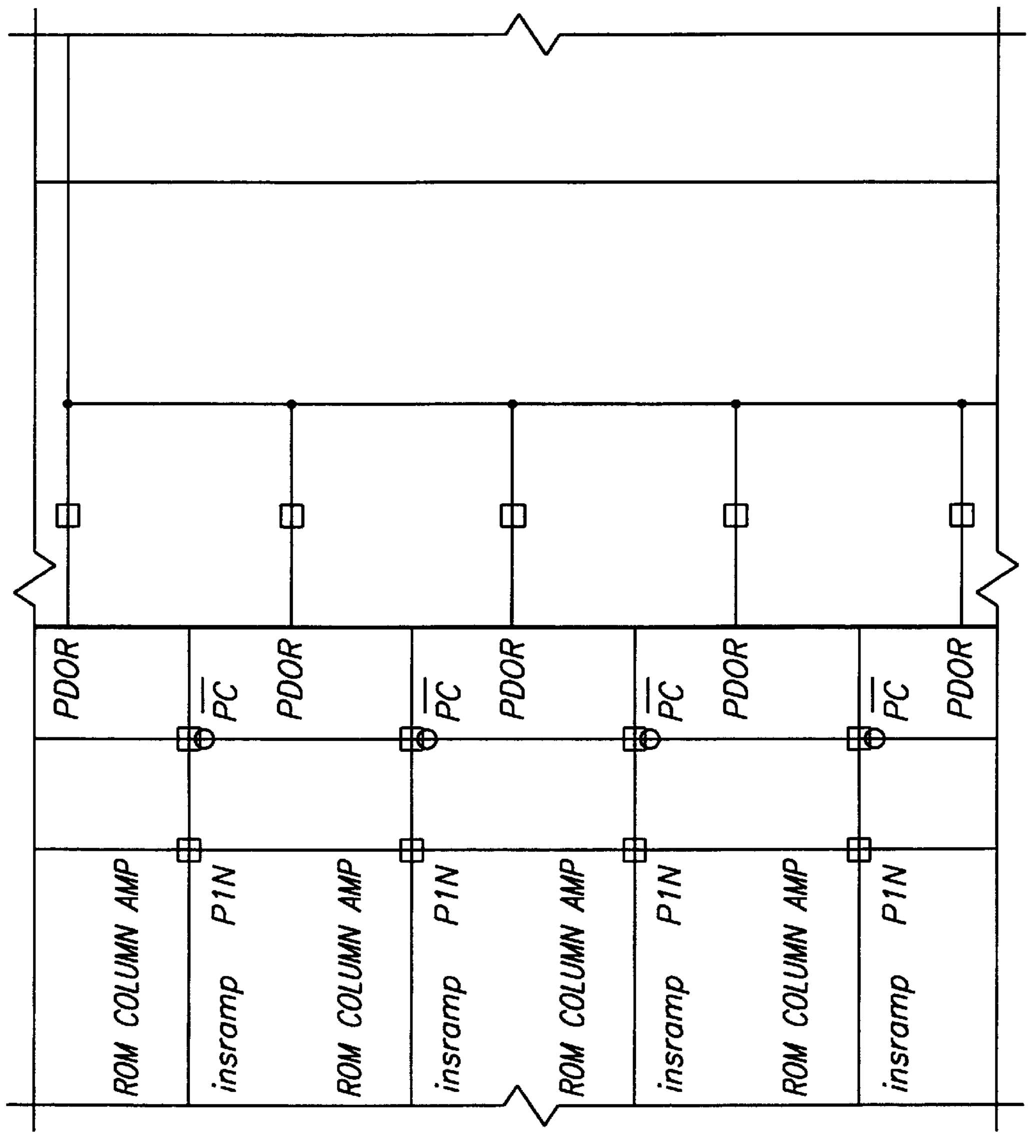
FIG. 1.0604G

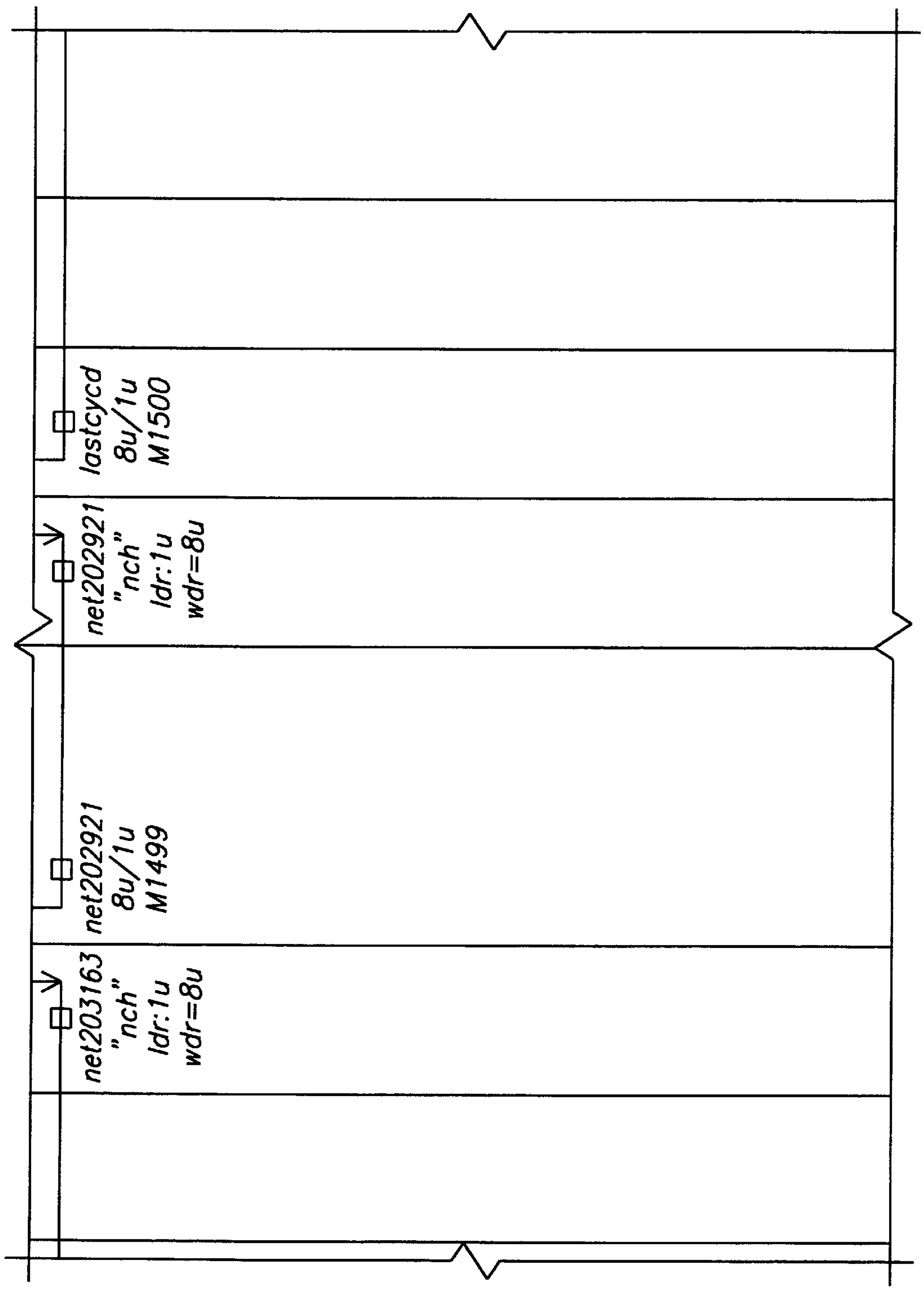
Fig. 7.0604GD

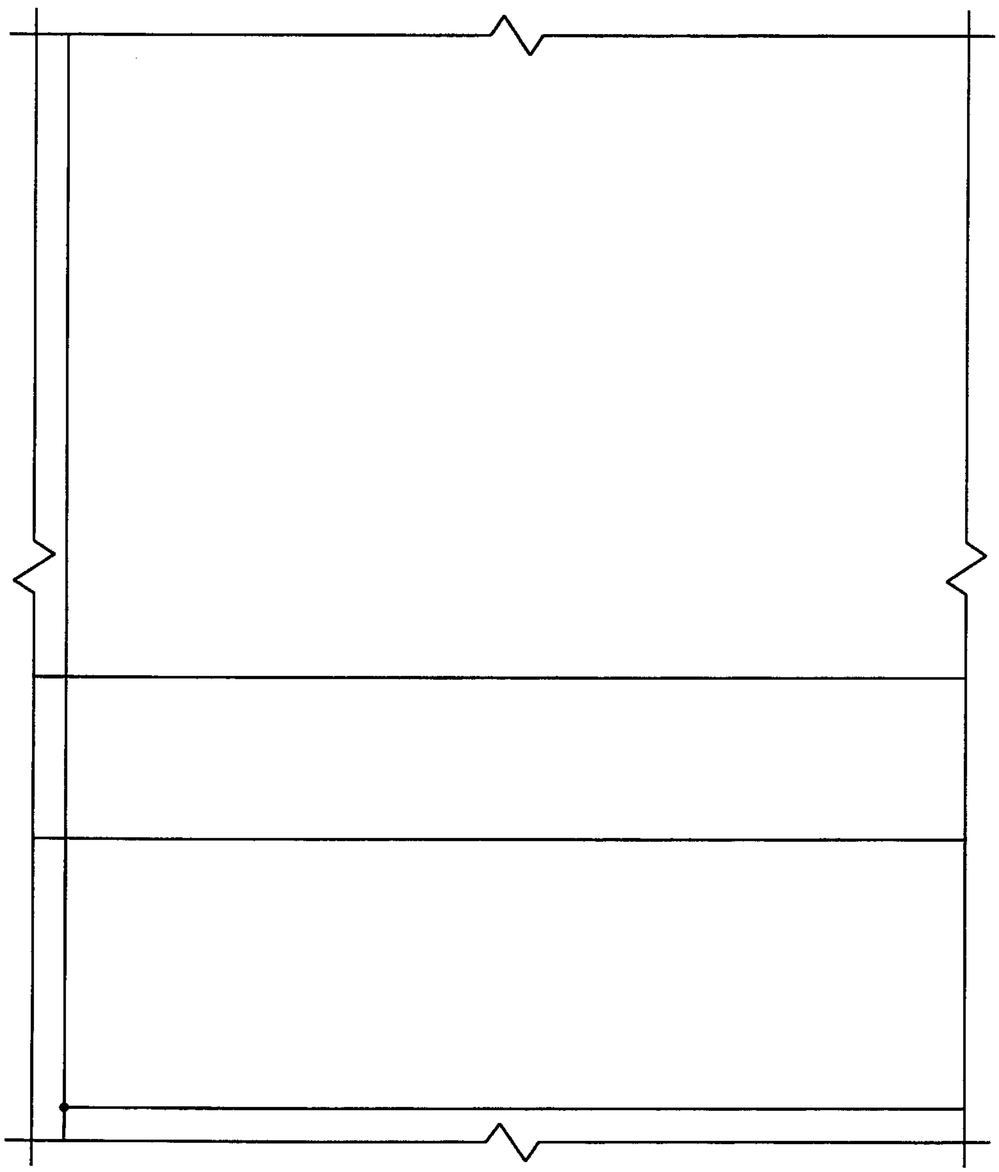
FIG. 7.0604GE

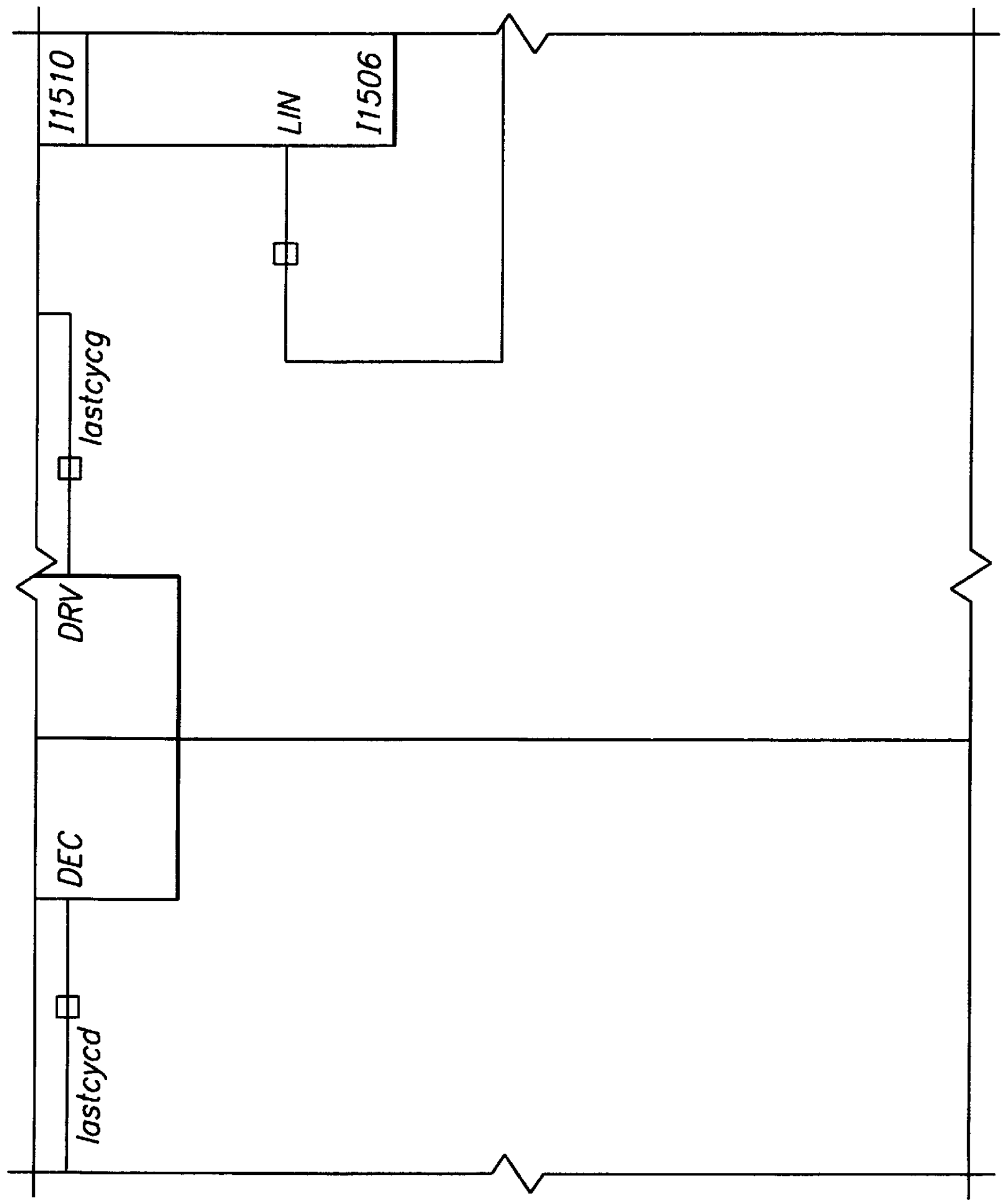
Fig. 7.0604GF

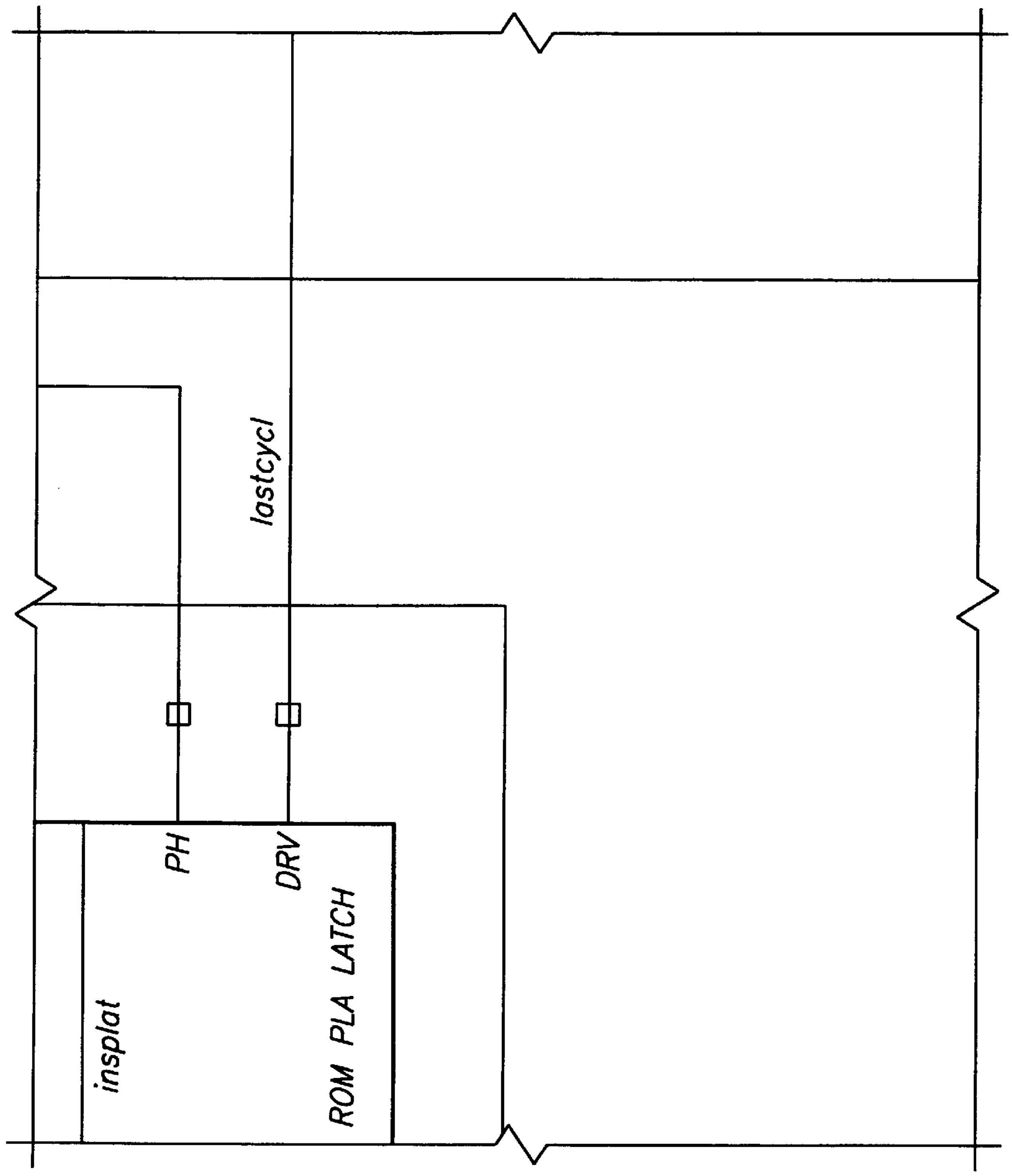
FIG. 7.0604GG

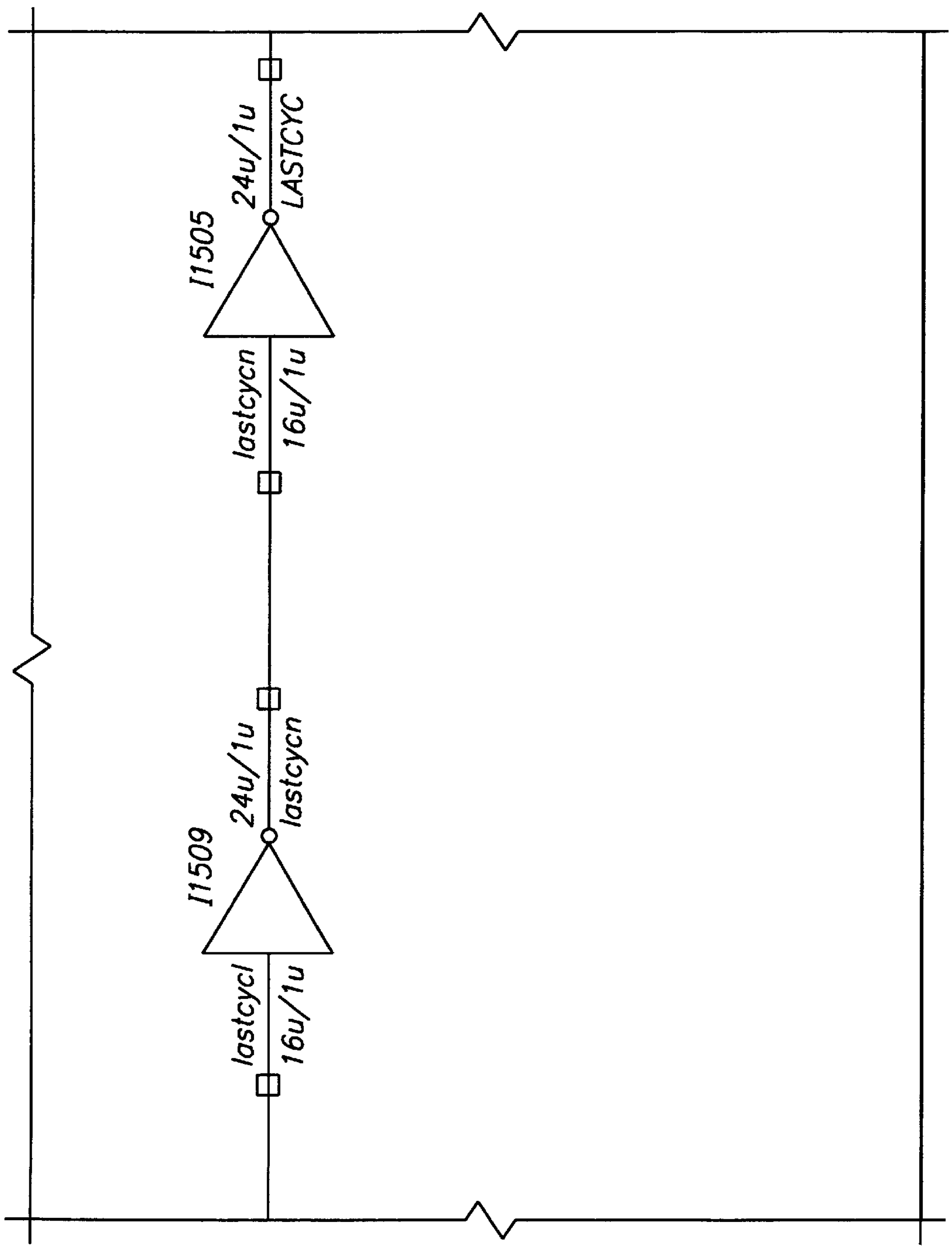
Fig. 7.0604GH

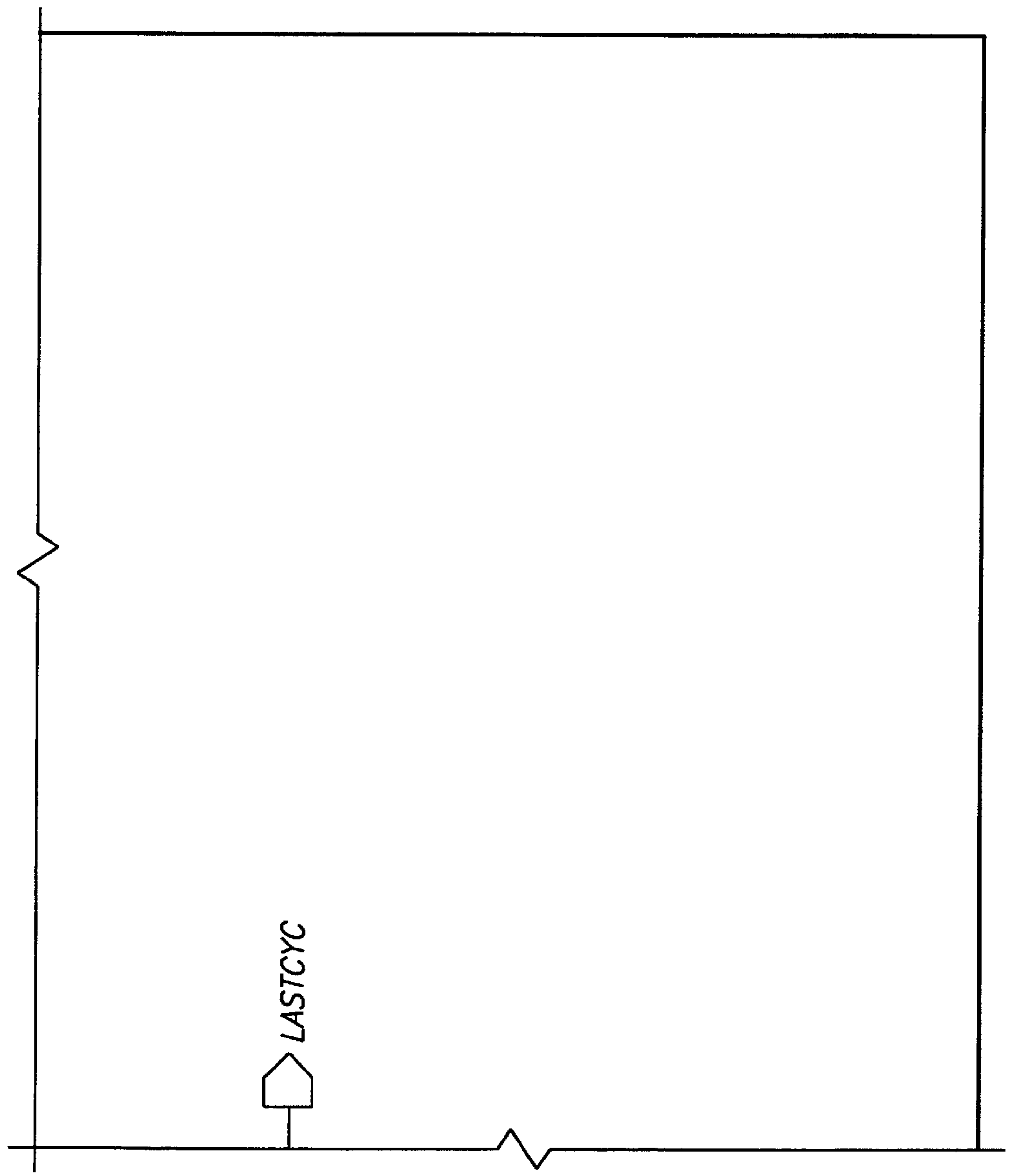
FIG. 7.0904GI

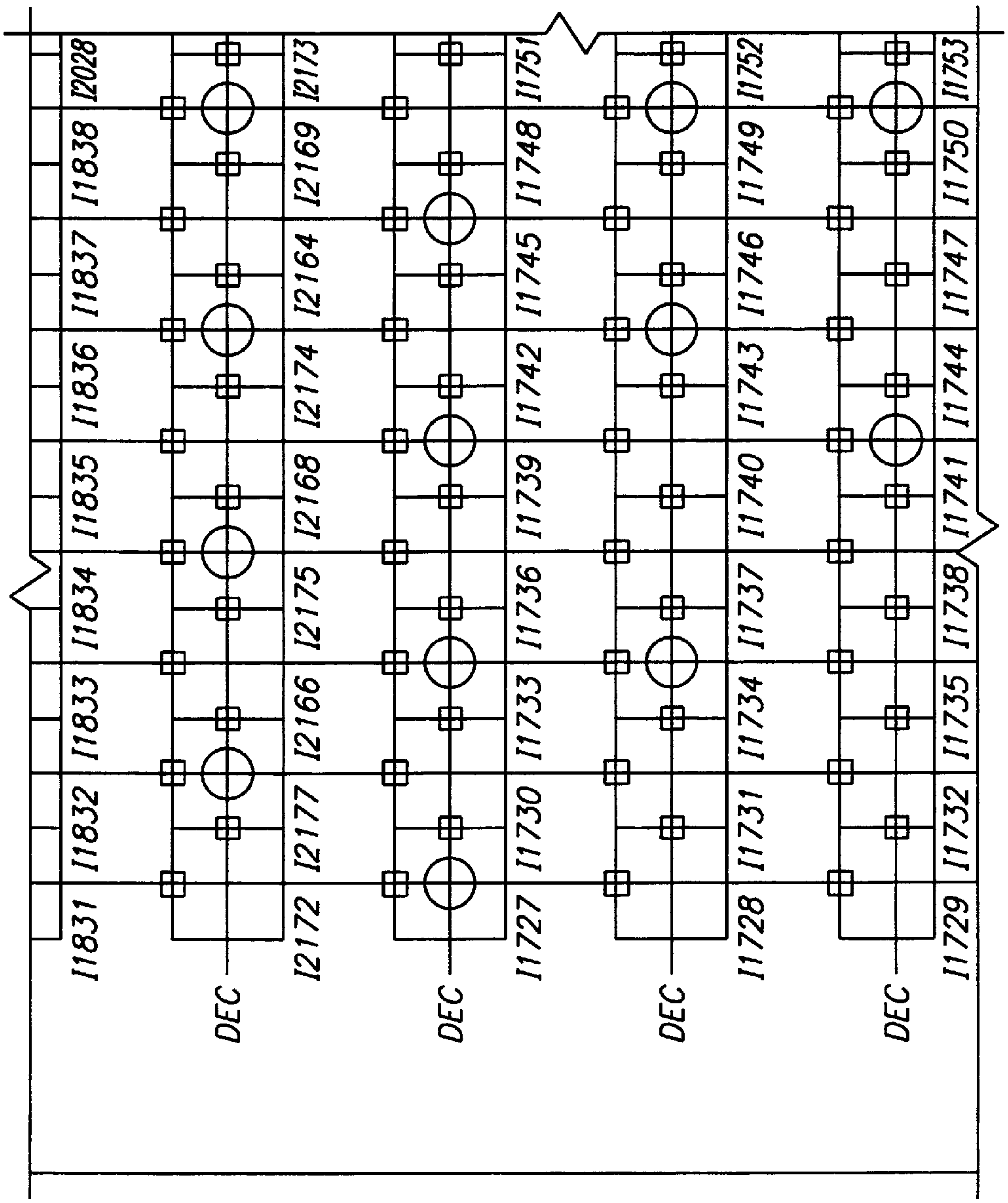
FIG. 1.0604AA

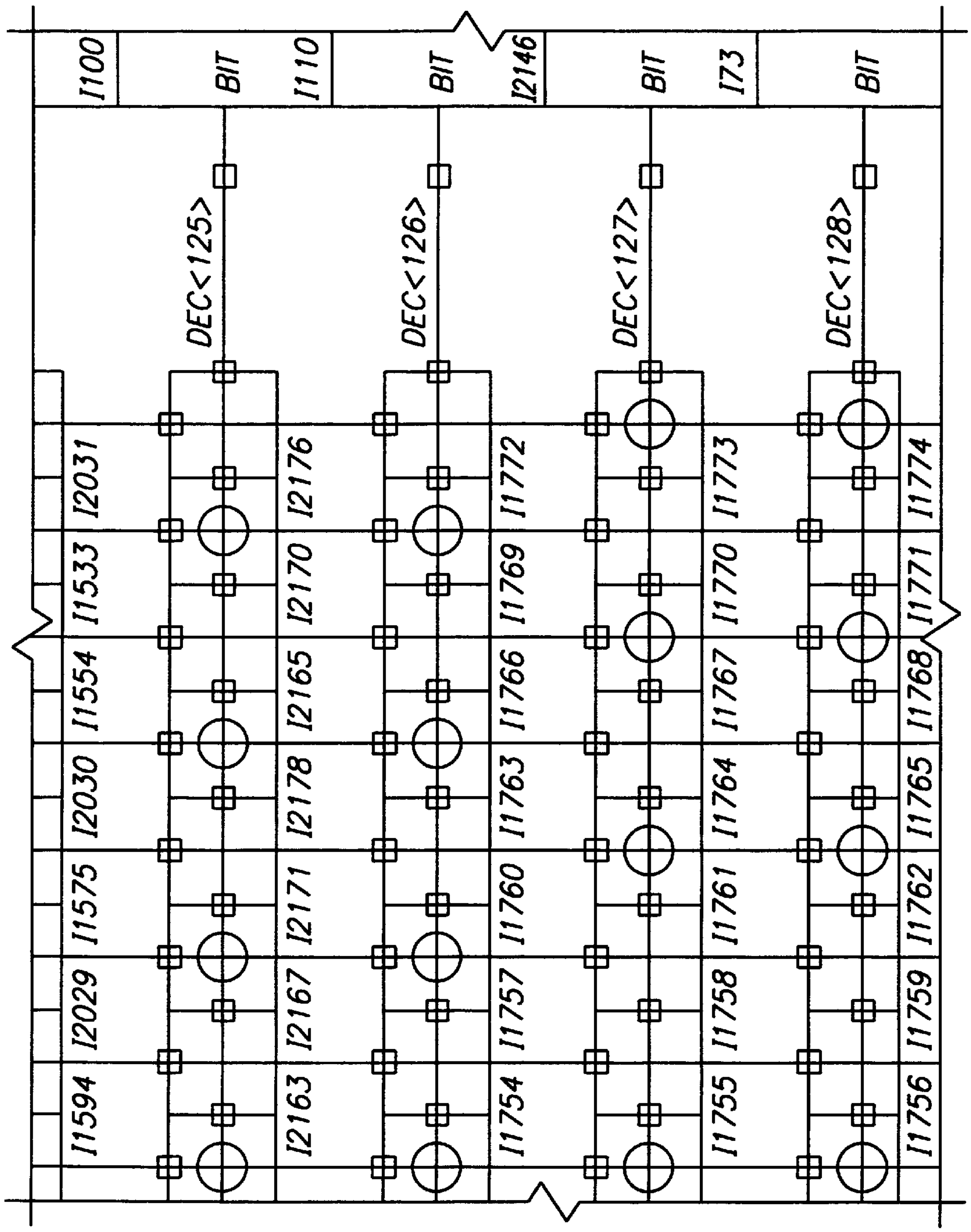
Fig. 7.060.4AB

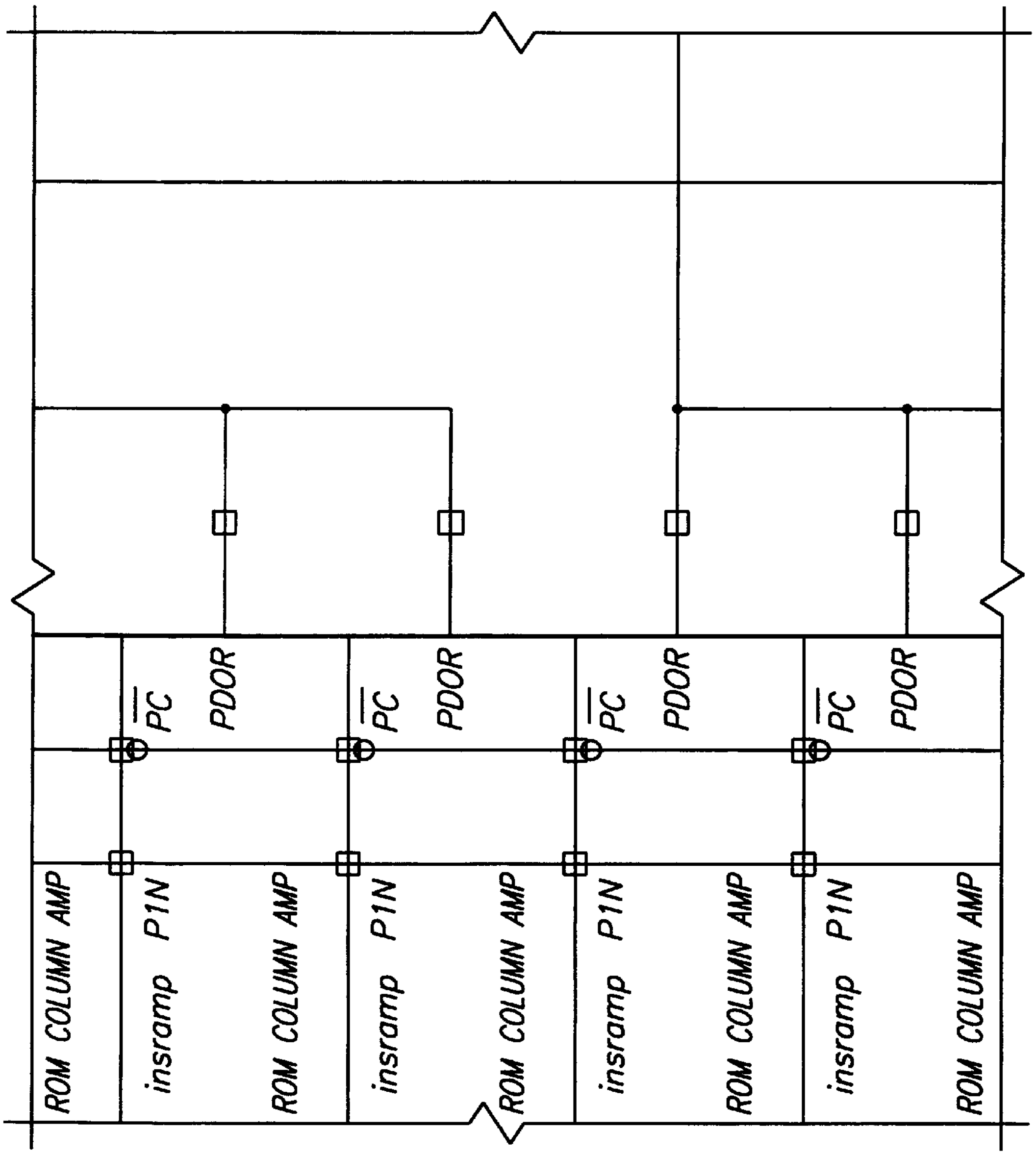
FIG. 7.0604HC

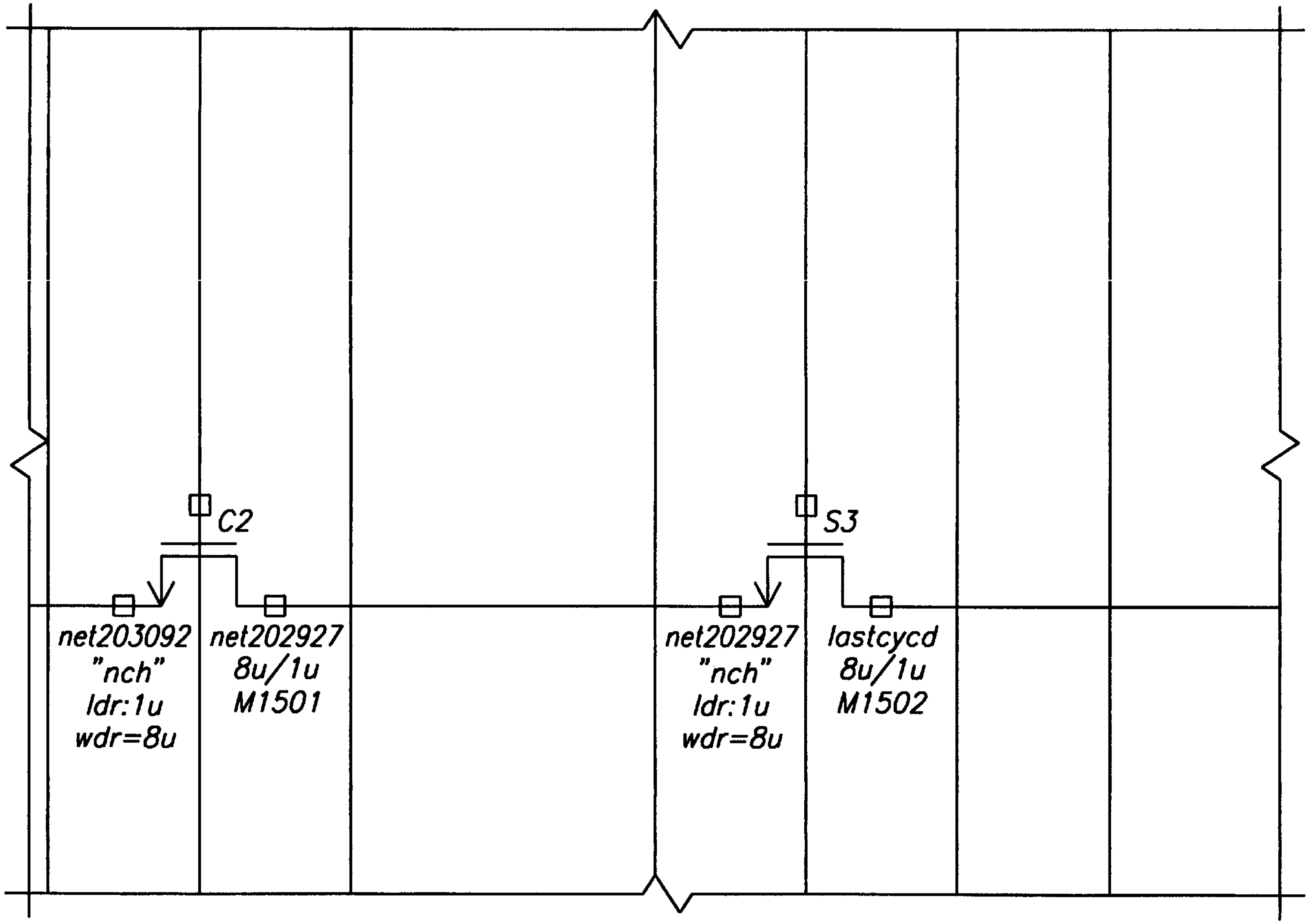
Fig. 7.0604HD

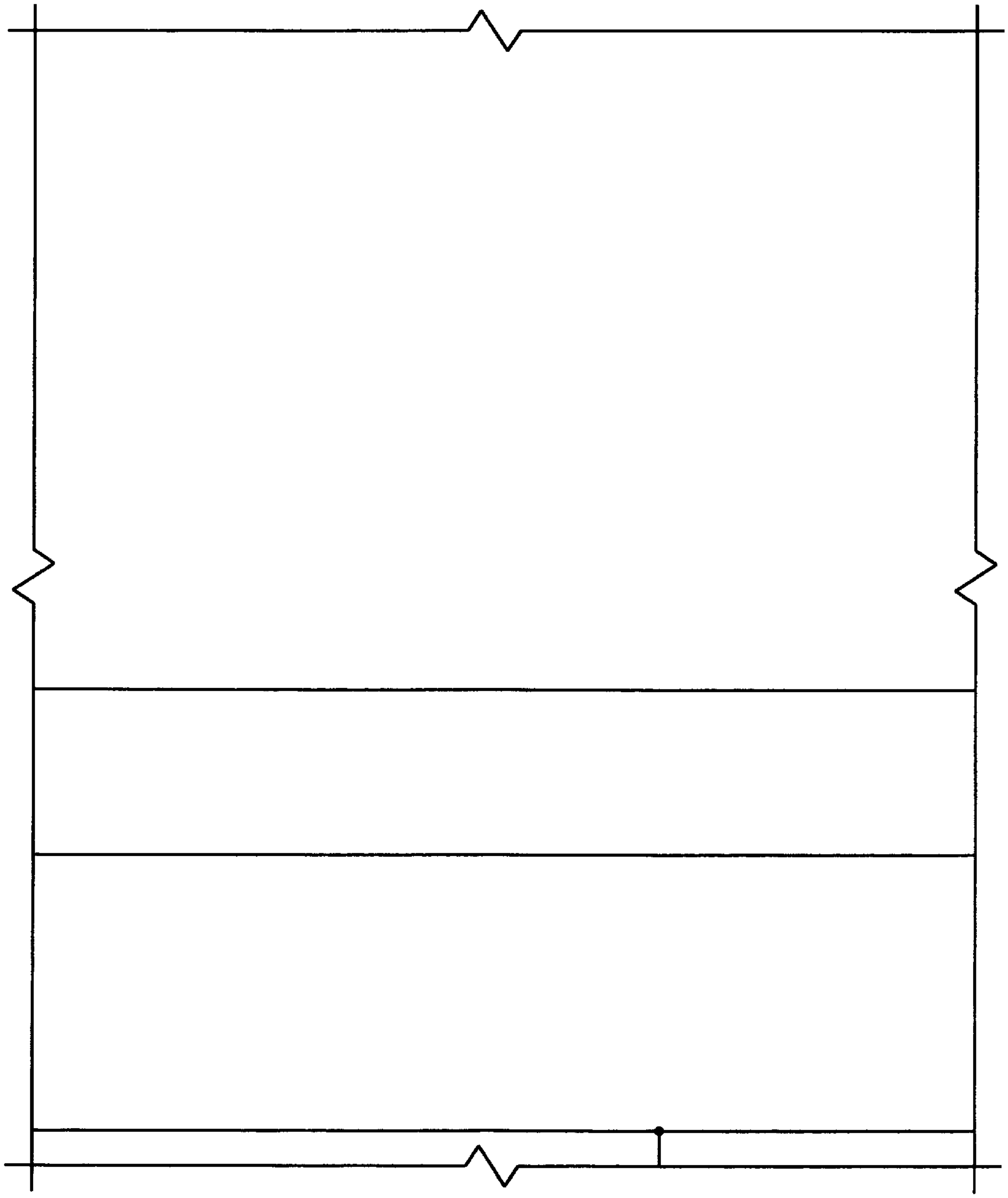
Fig. 1.0064HE

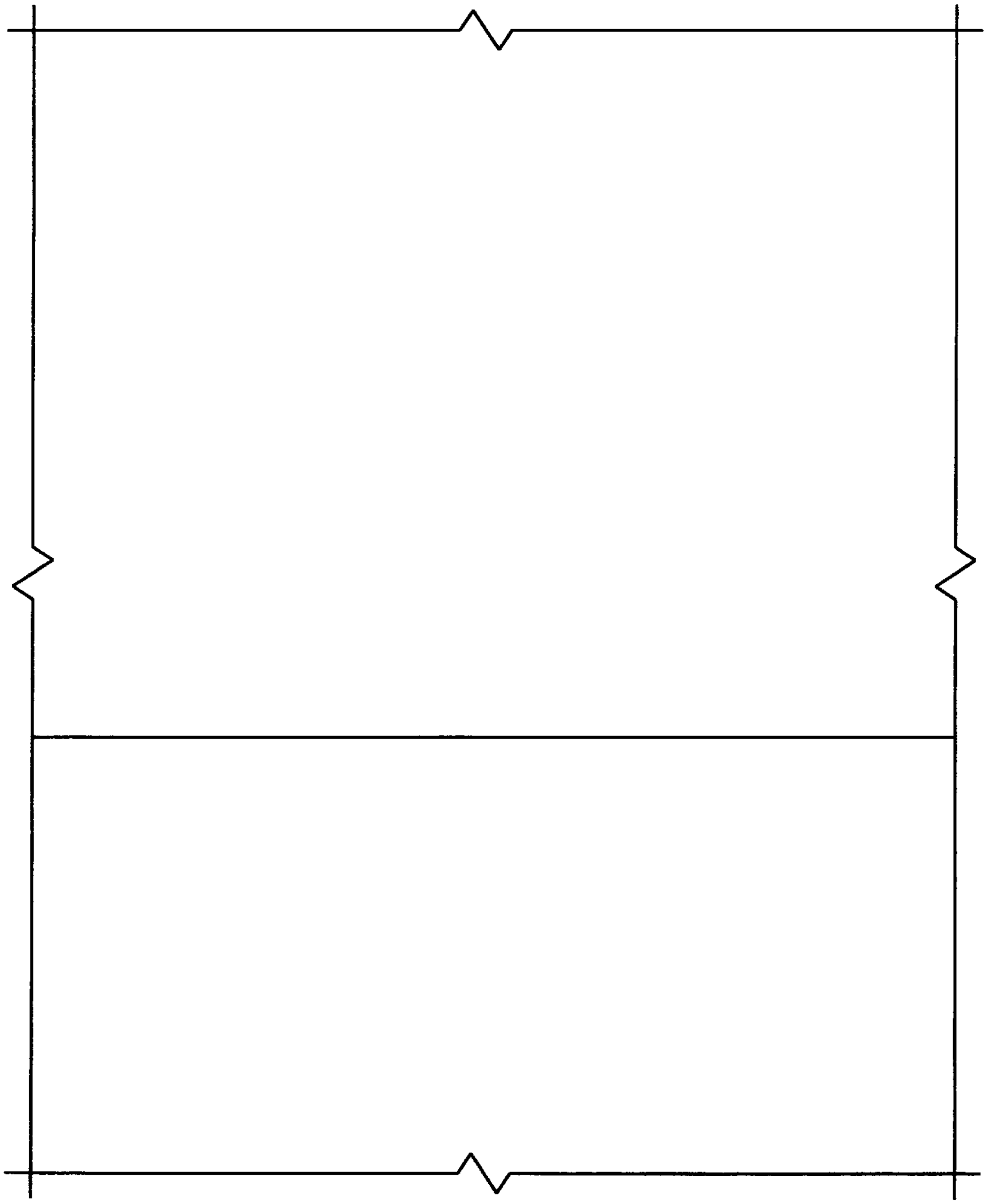
FIG. 1.0604HF

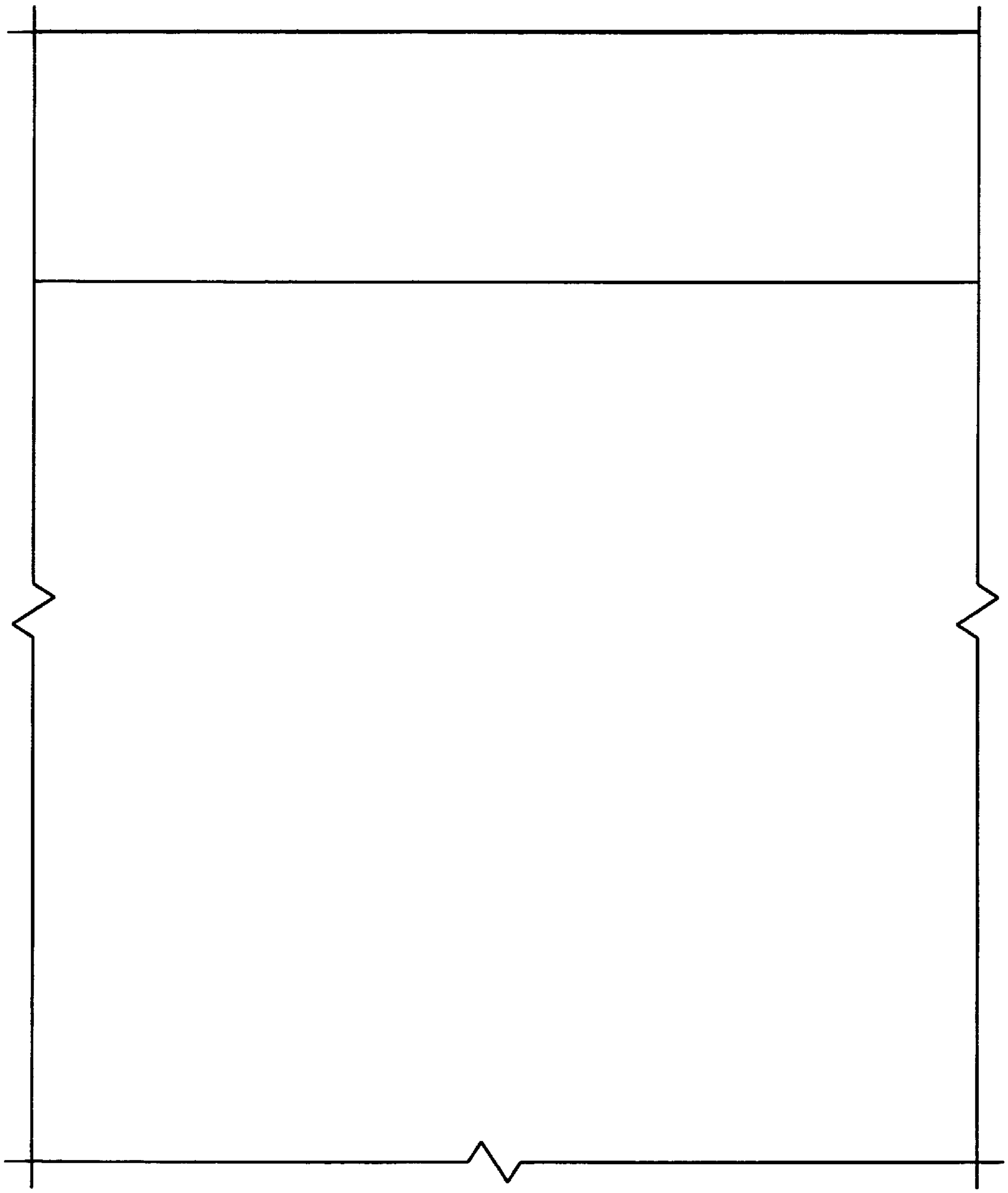
FIG. 7.060.4HG

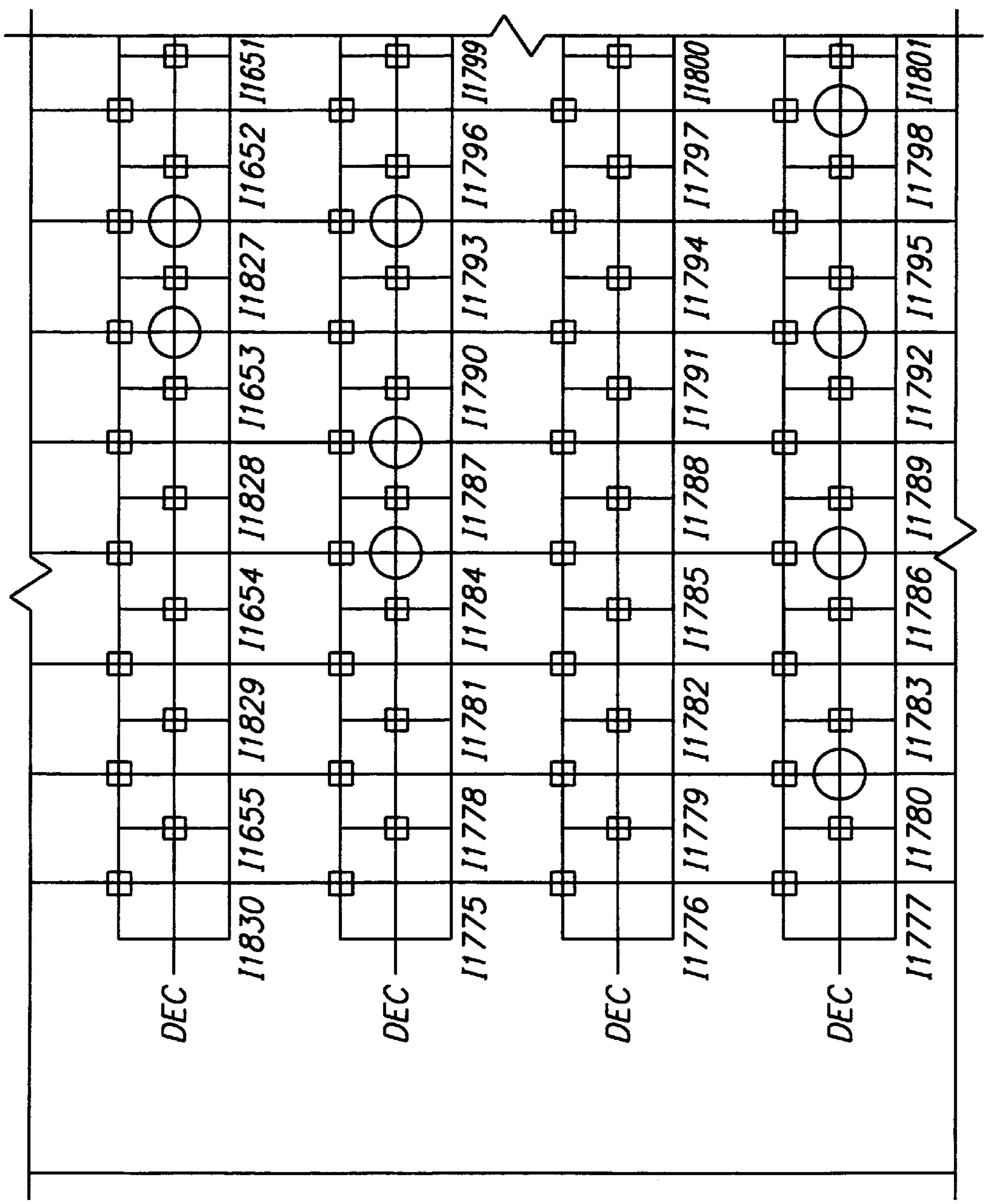
FIG. 7.060411A

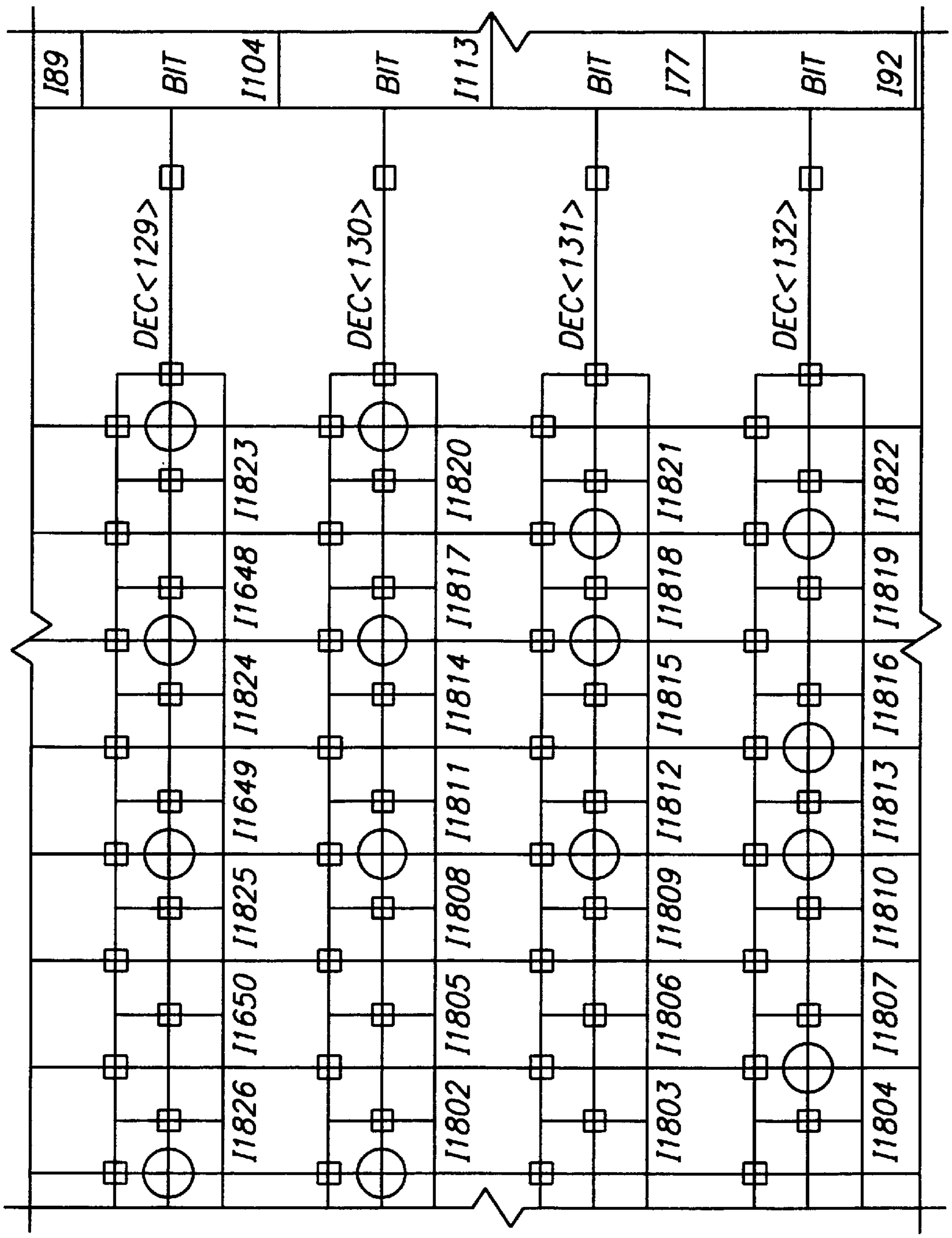
Fig. 7.0604IIB

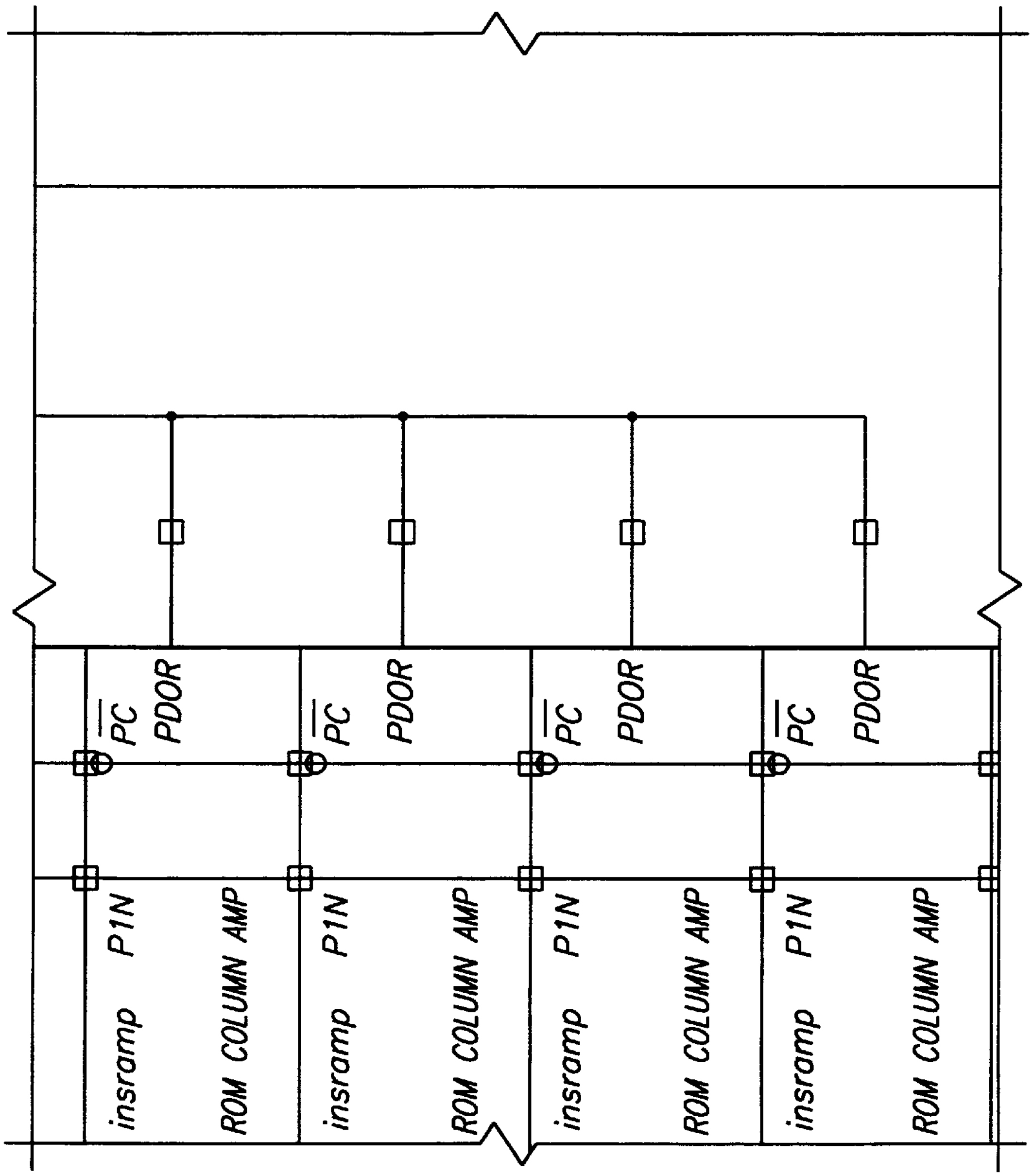
Fig. 7.0604C

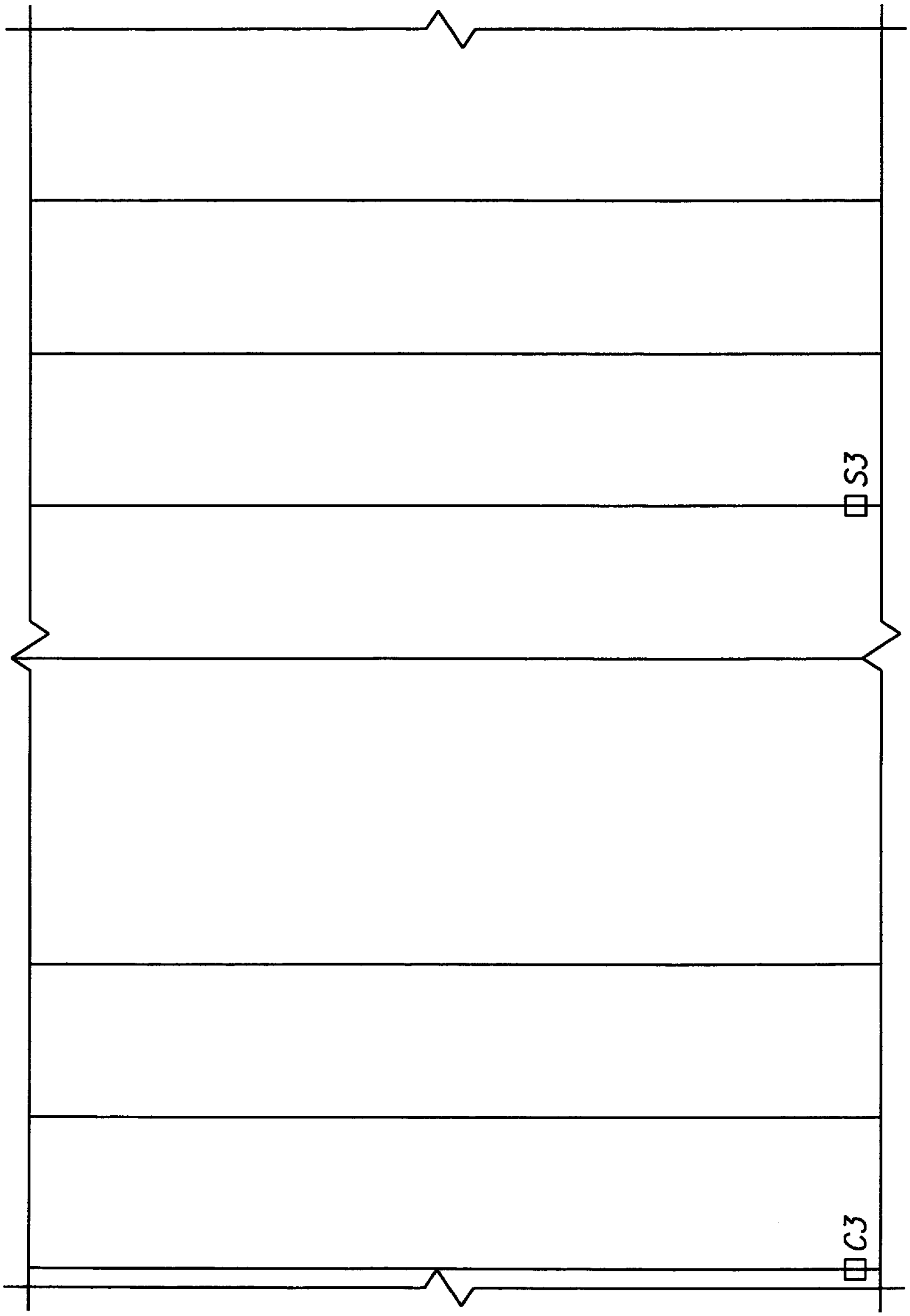
Fig 7.0604ID

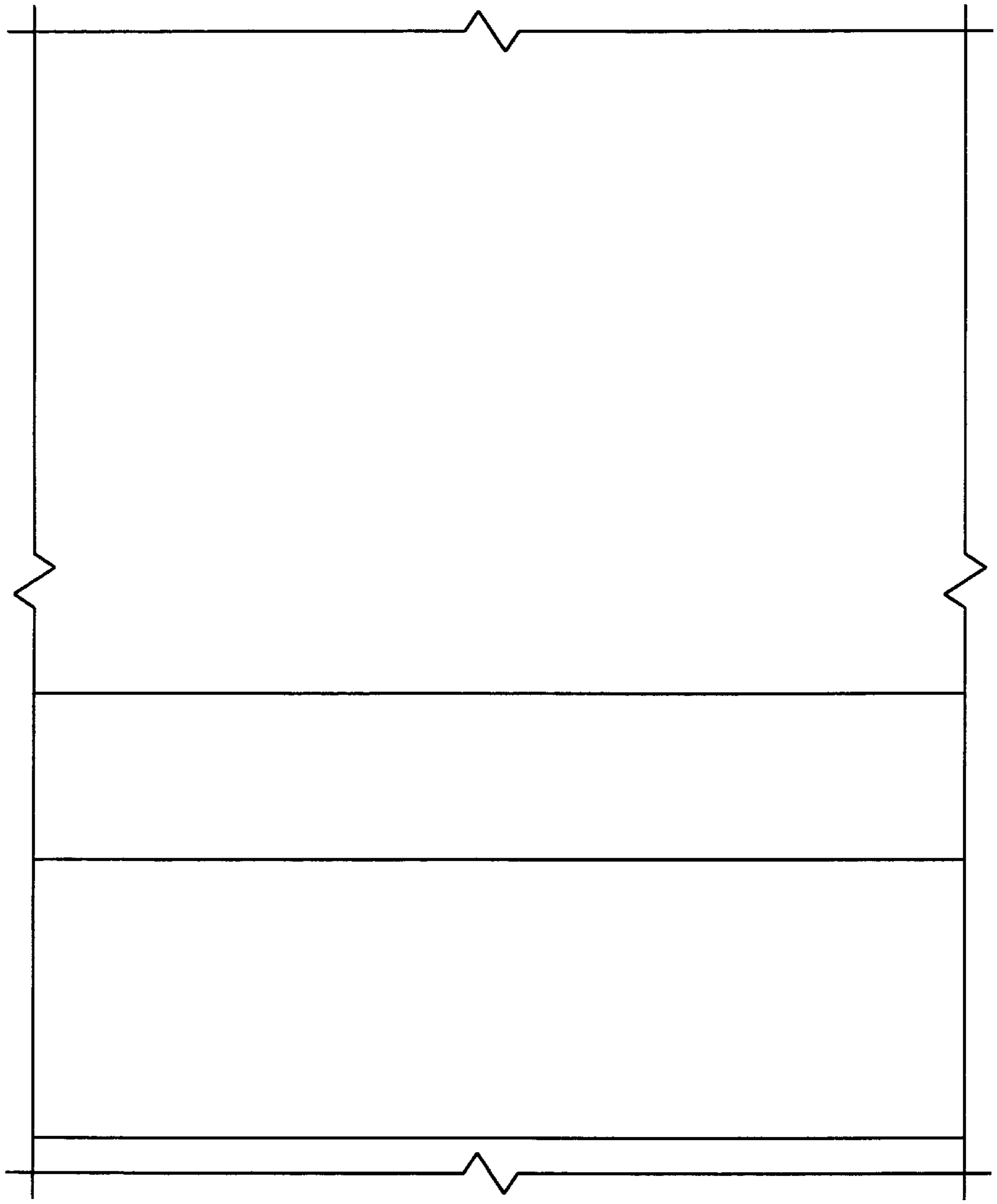
FIG. 7.0604E

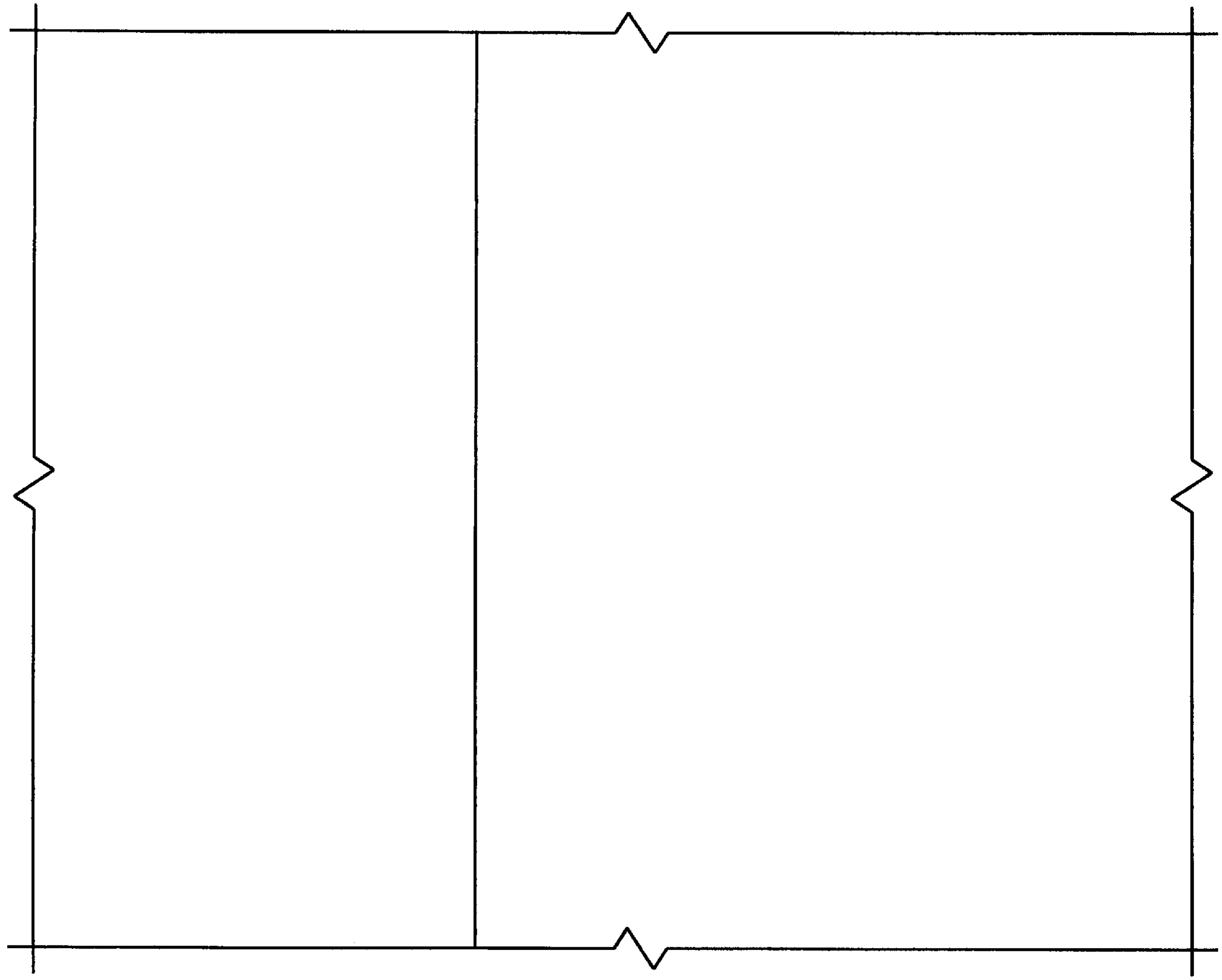
Fig. 7.0604IF

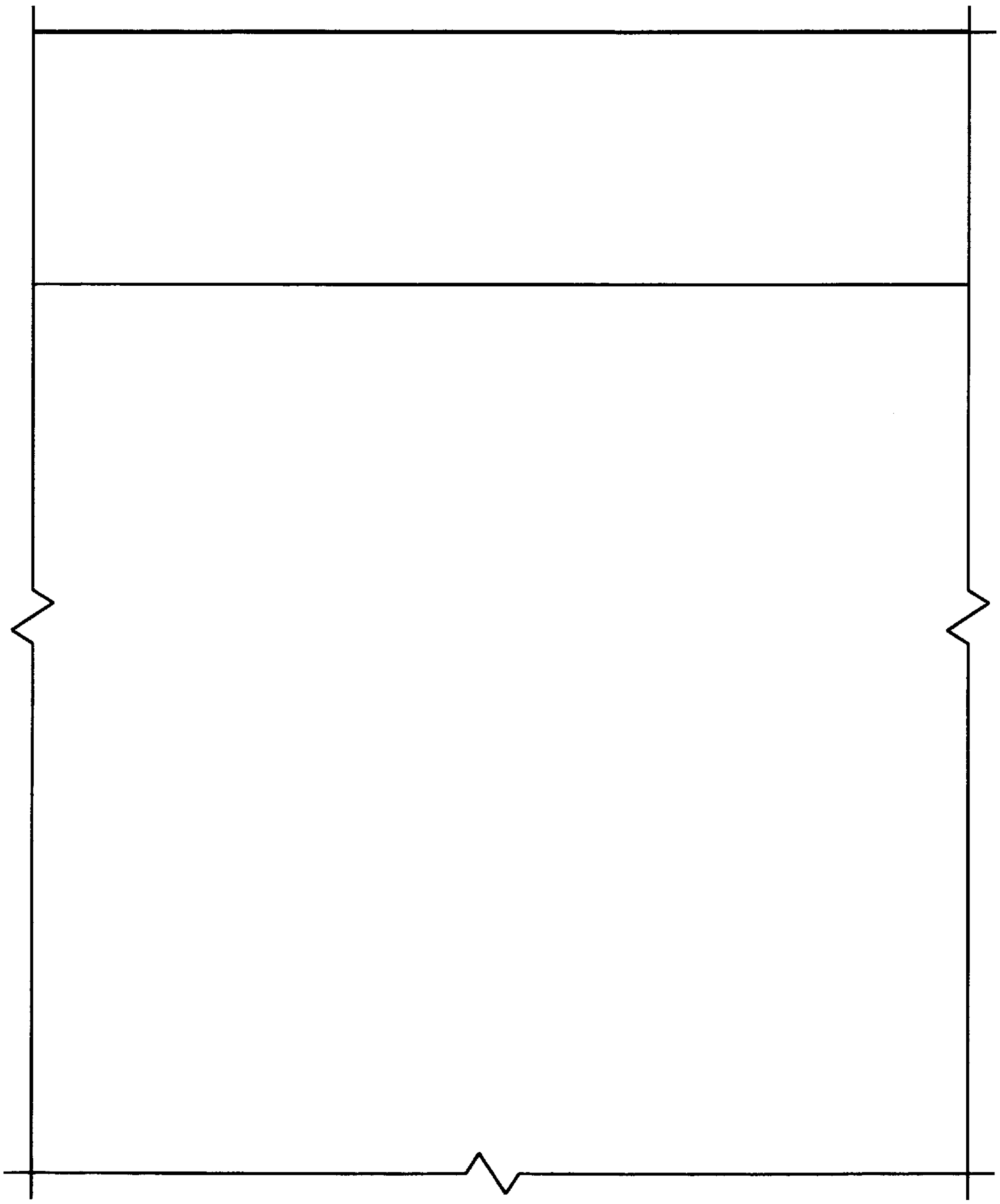
FIG. 7.0604IG

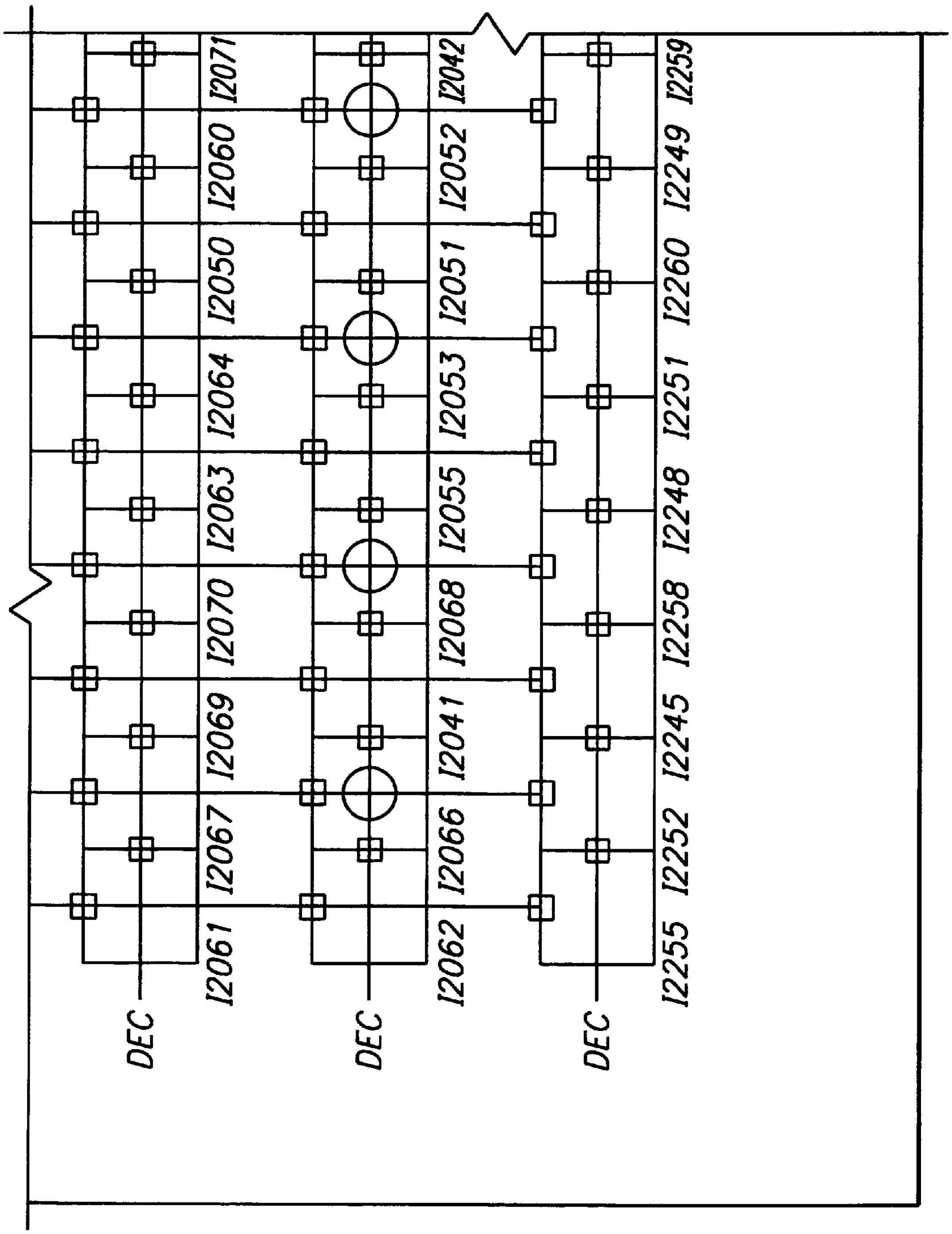
FIG. 7.0604A

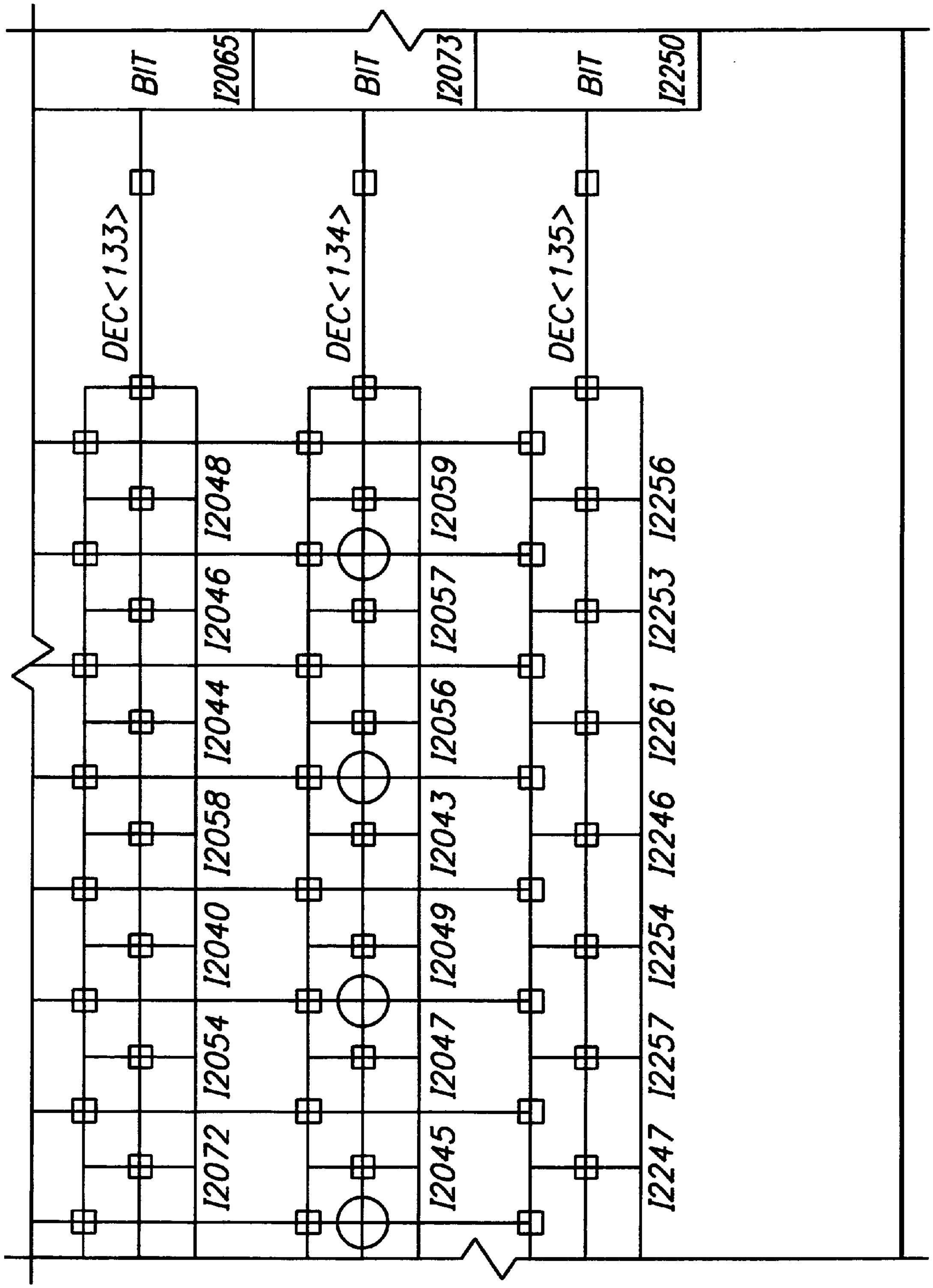
Fig. 7.0604JB

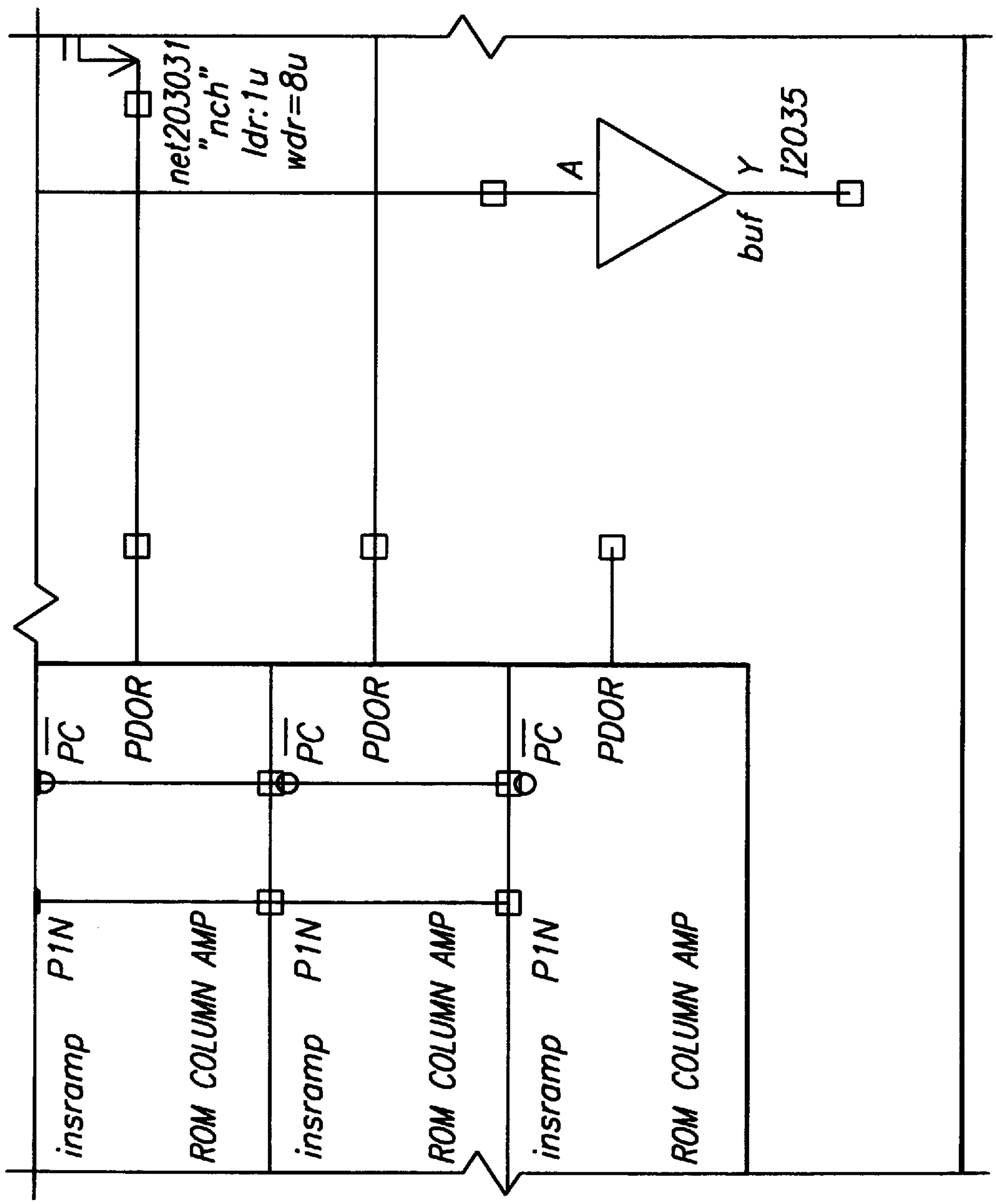
Fig. 7.0604.1C

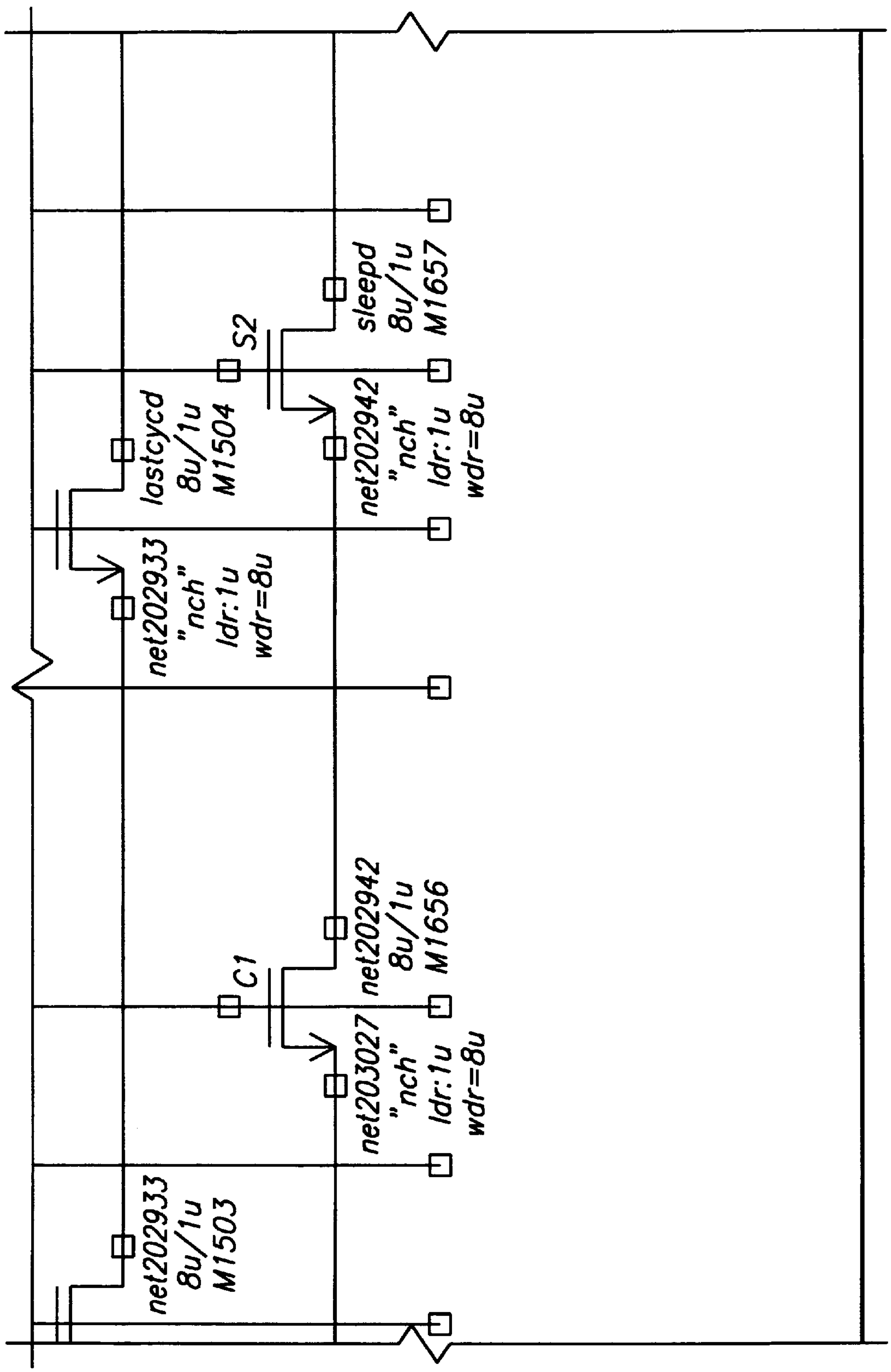
Fig 7.0060F.MM

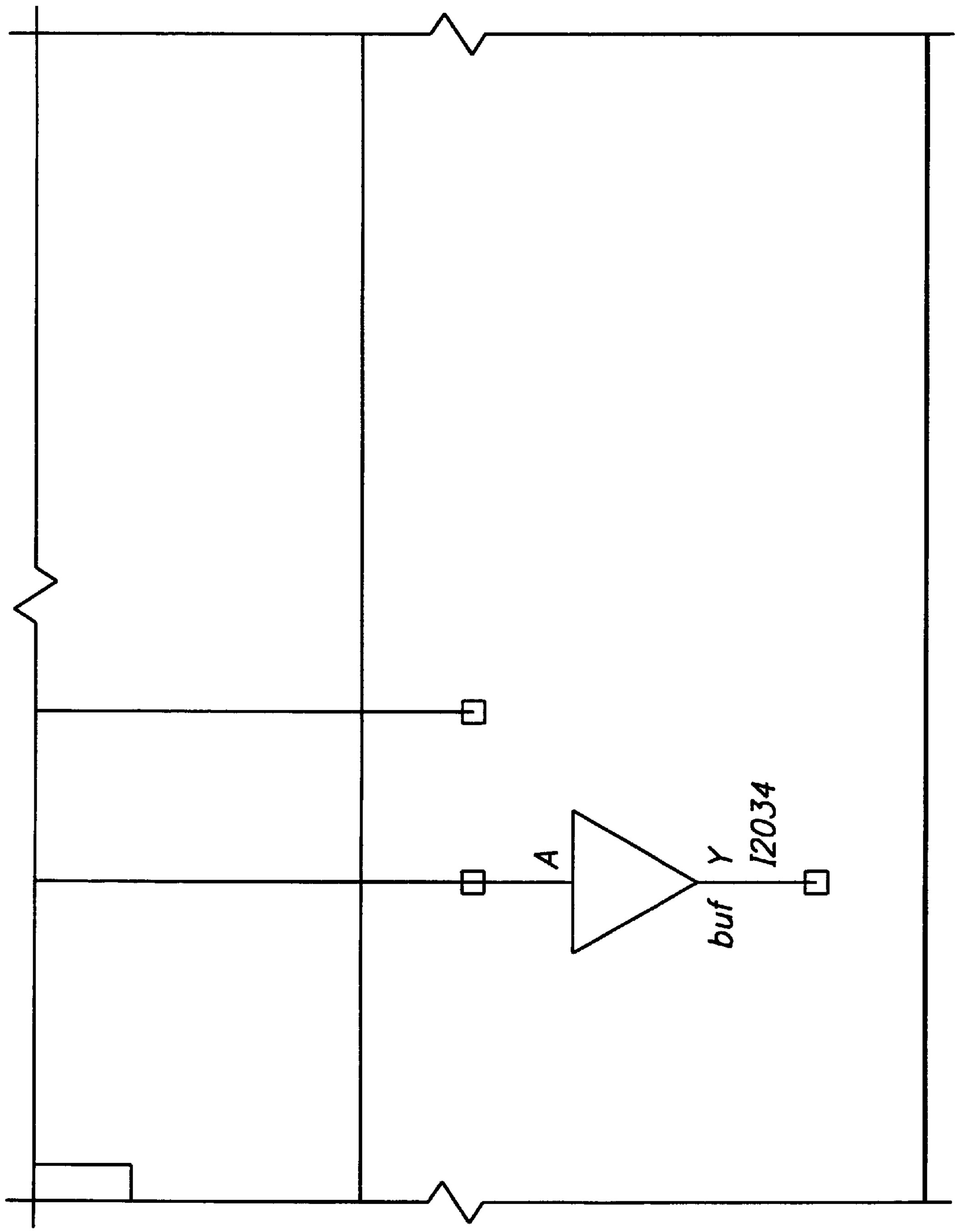
Fig 7.0604AE

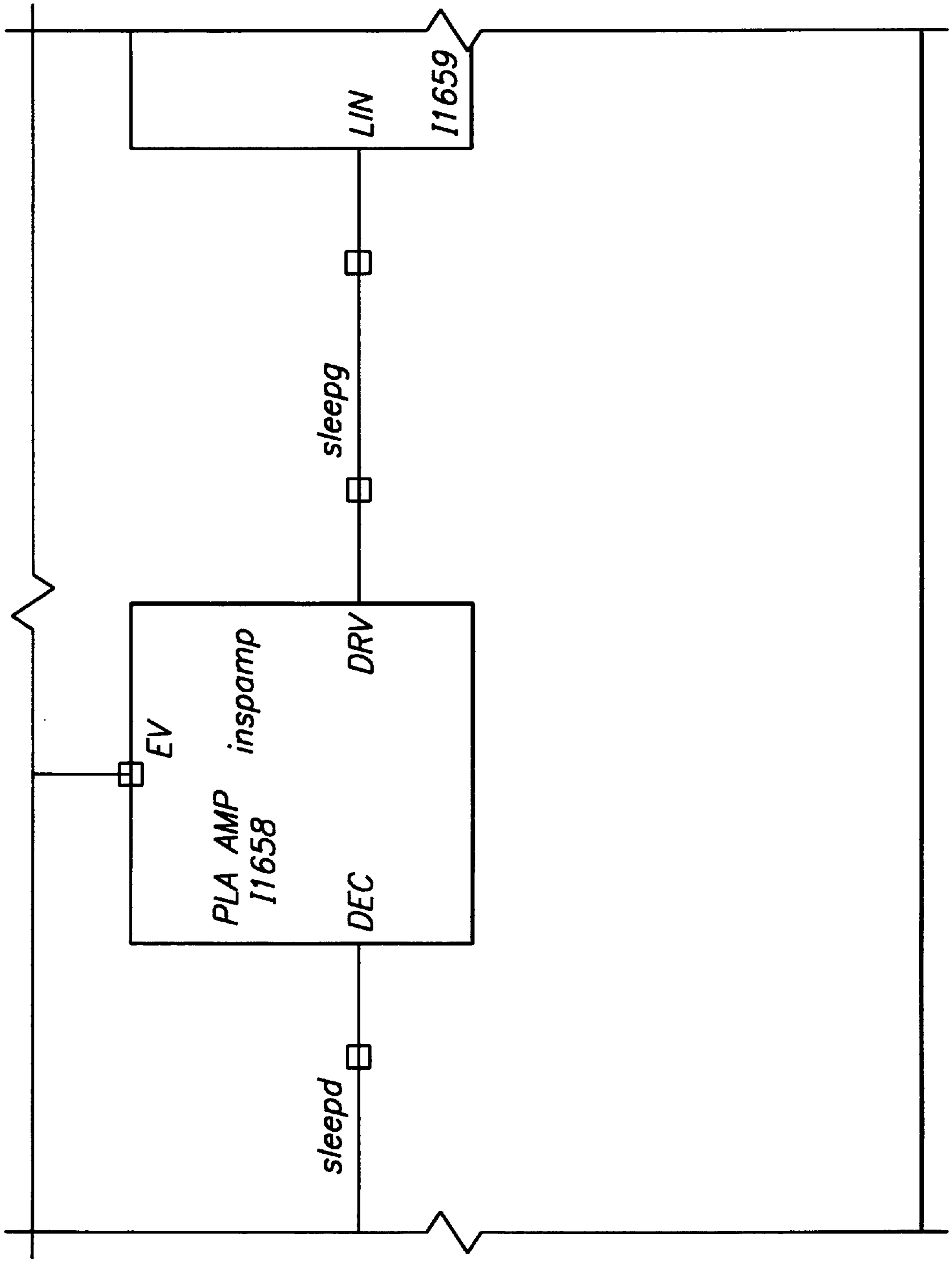
LIN
I1659
sleepg
DRV
inspamp
EV
PLA AMP
I1658
DEC
sleepd

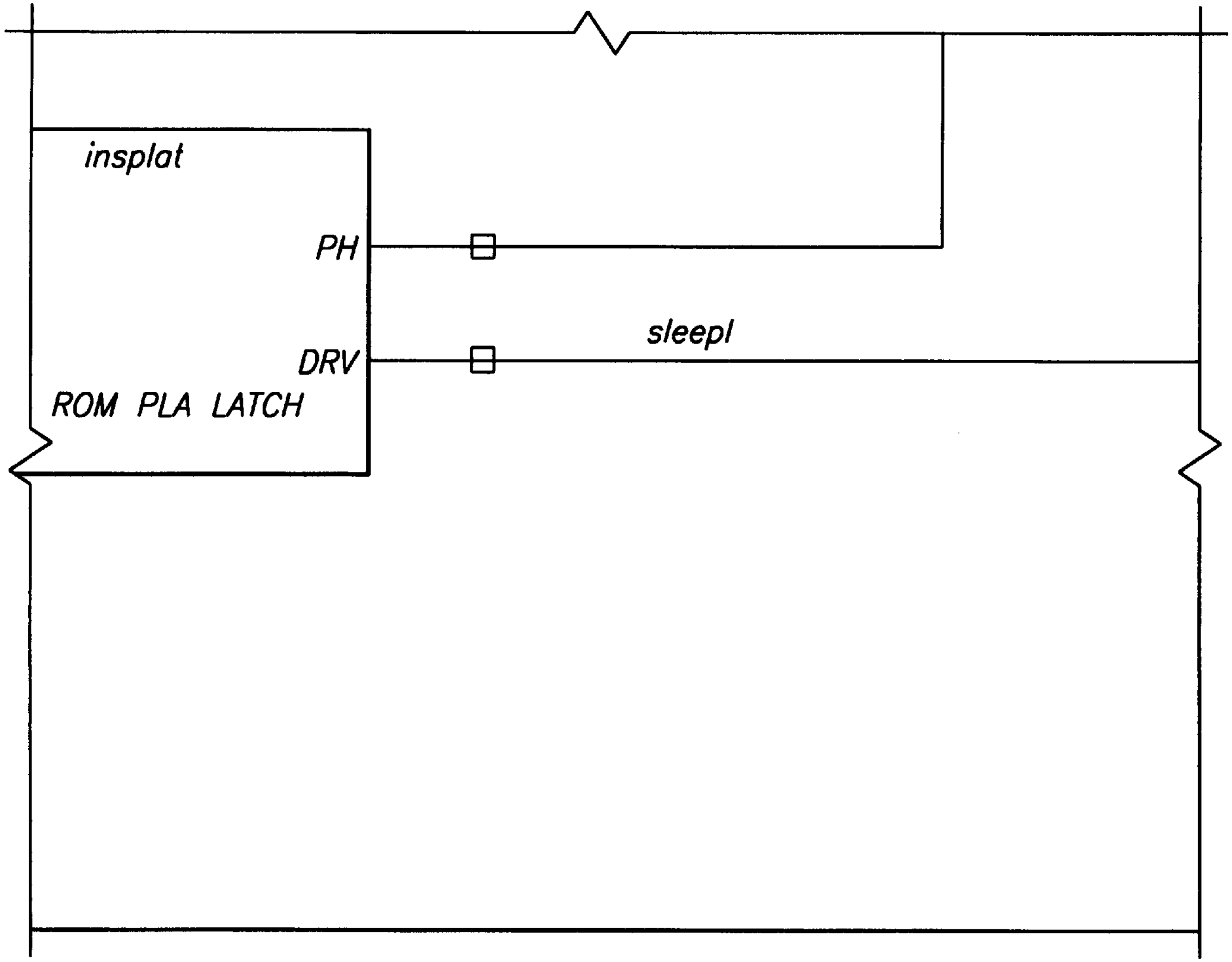
Fig 7.0604JG

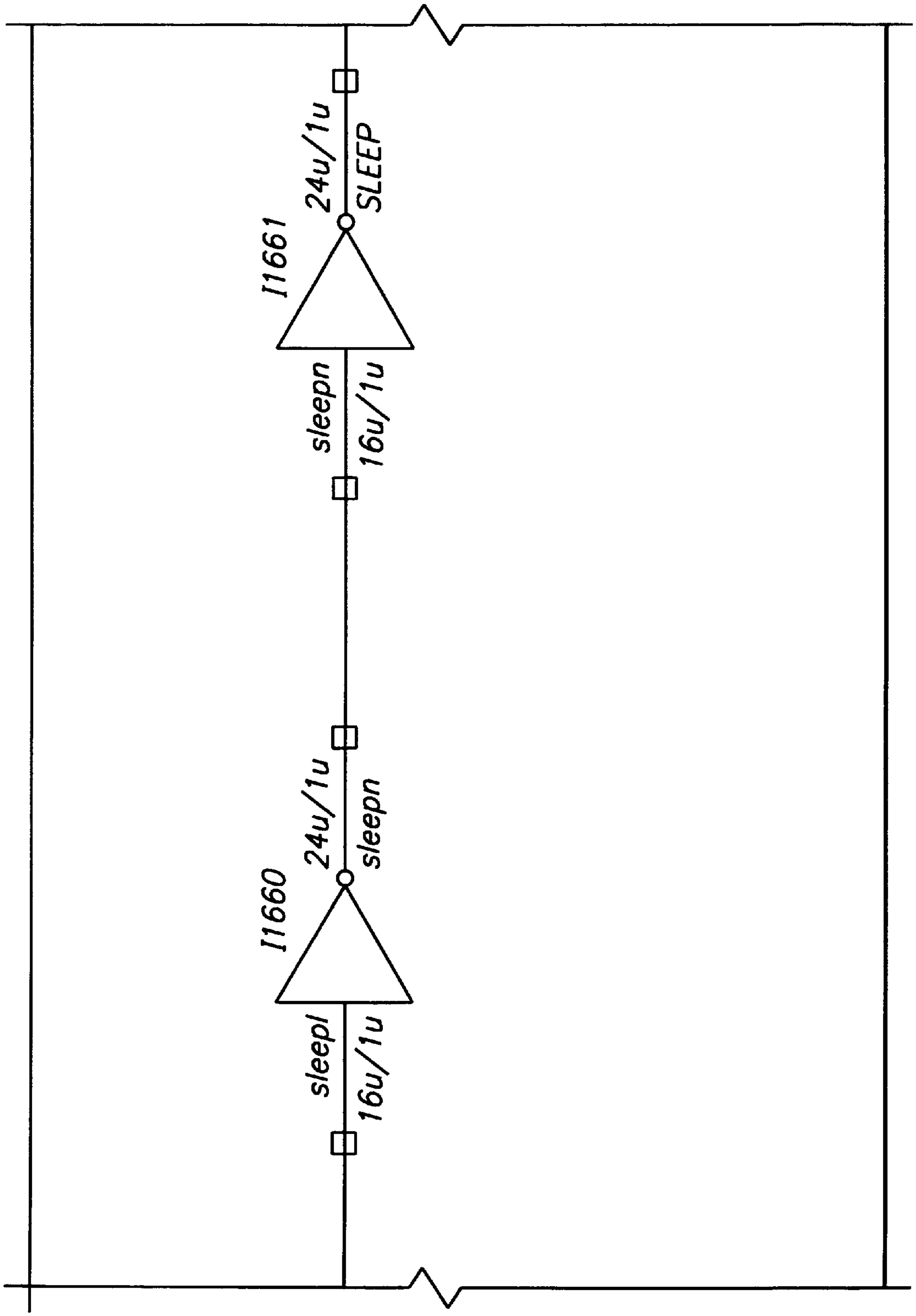
Fig. 7.050.L

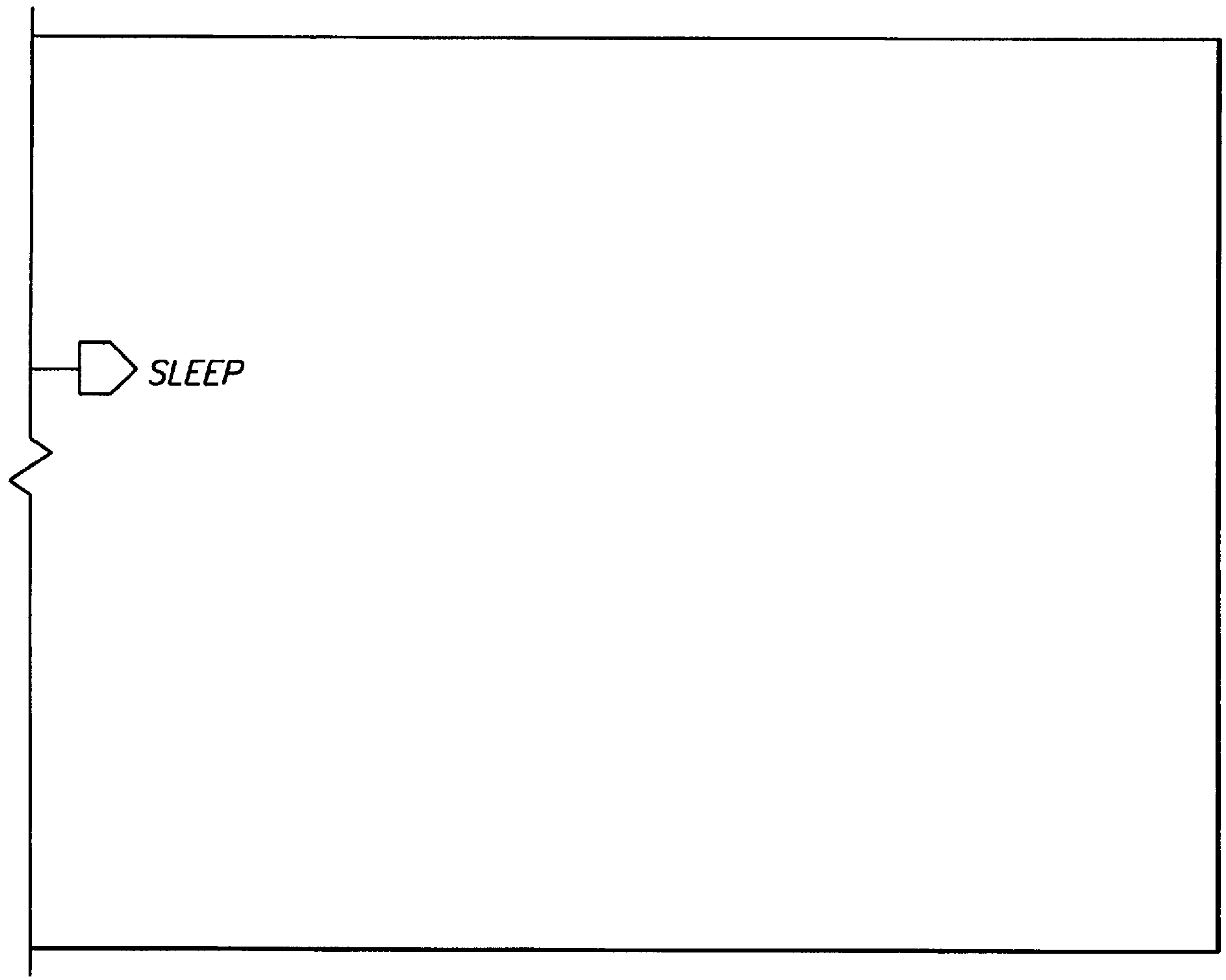
FIG. 7.0604JI

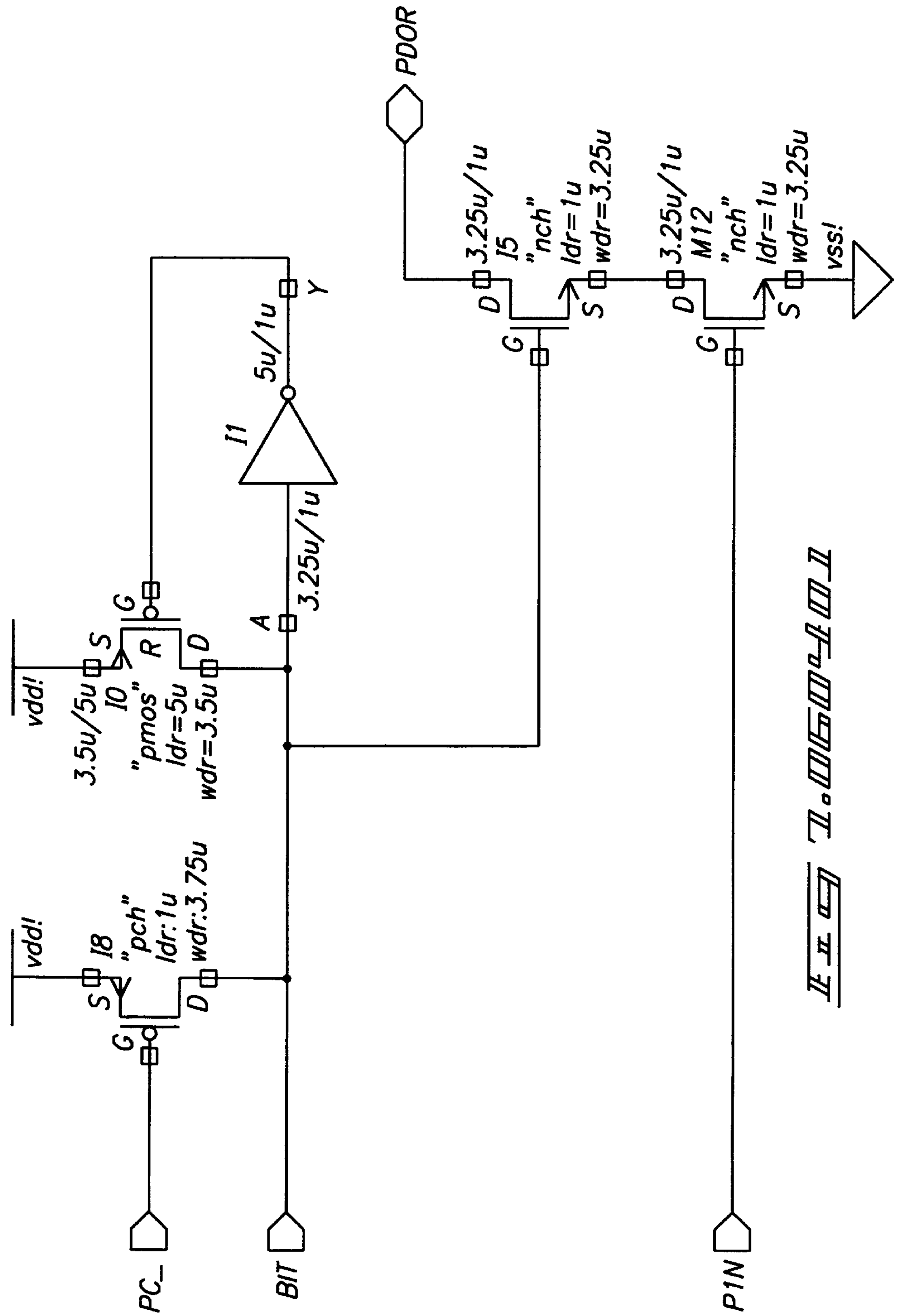
FIG. 1.0640.1

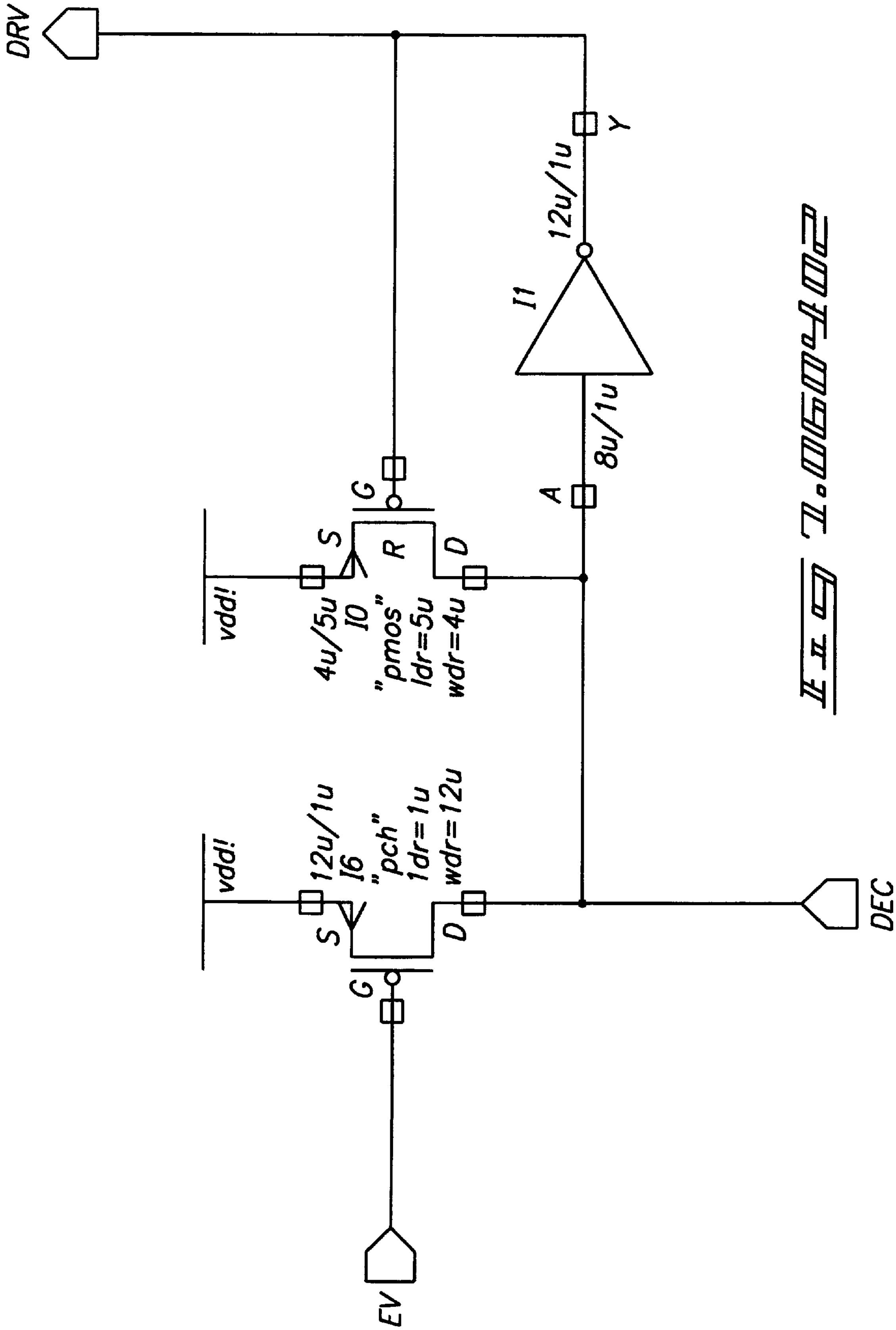
Fig. 7.06042

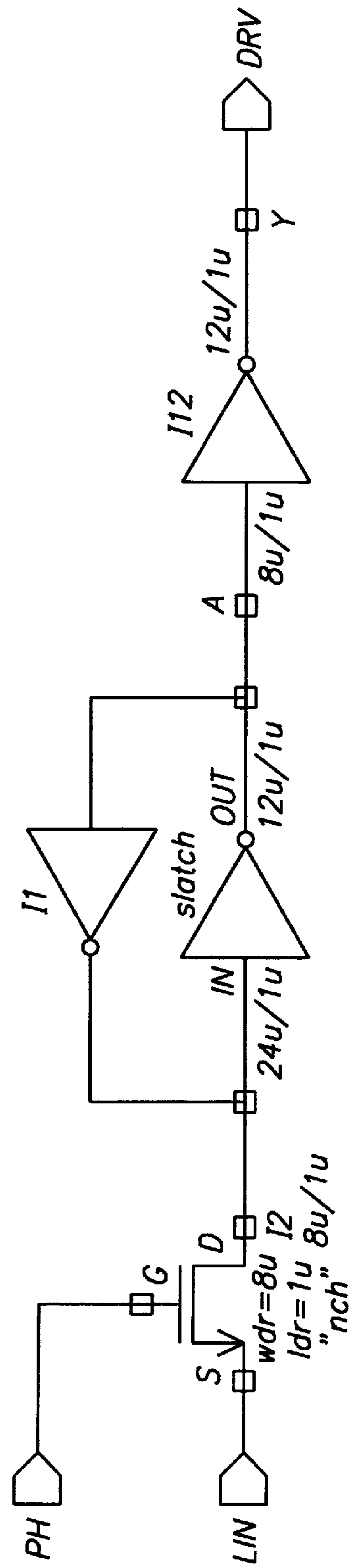
Fig. 7.0090.403

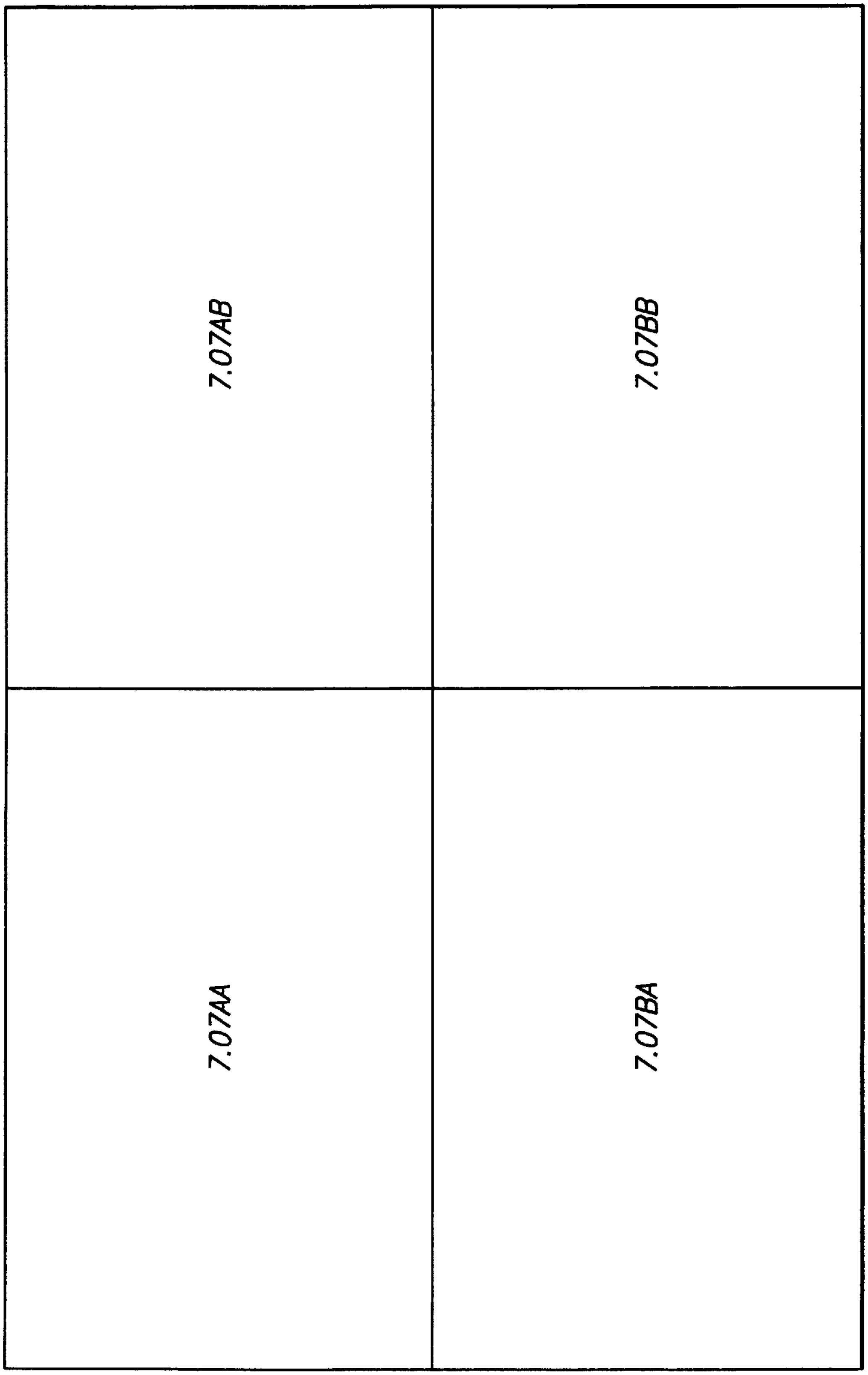
FIG. 7.07

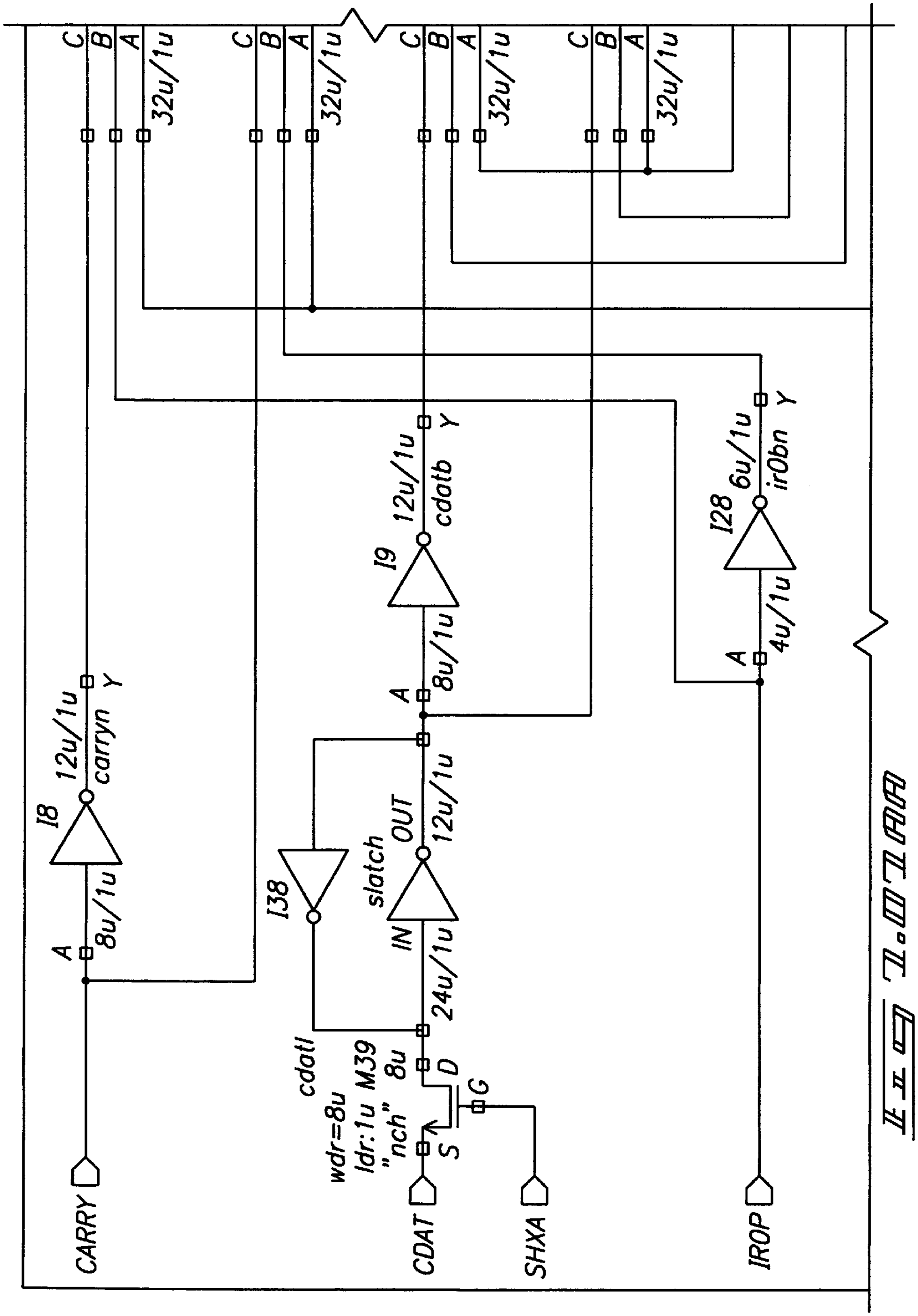
FIG. 7.07AA

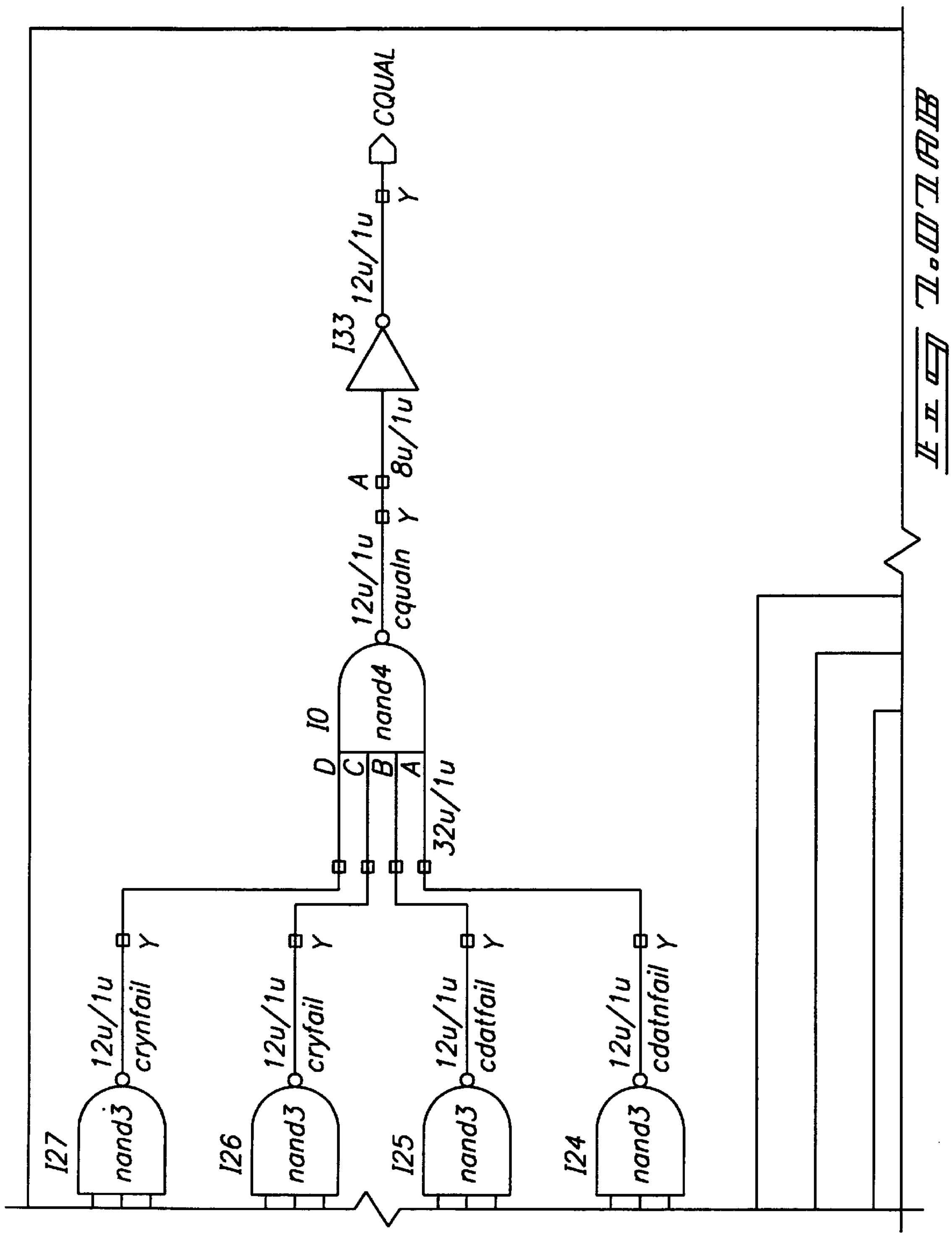
Fig. 7.07AB

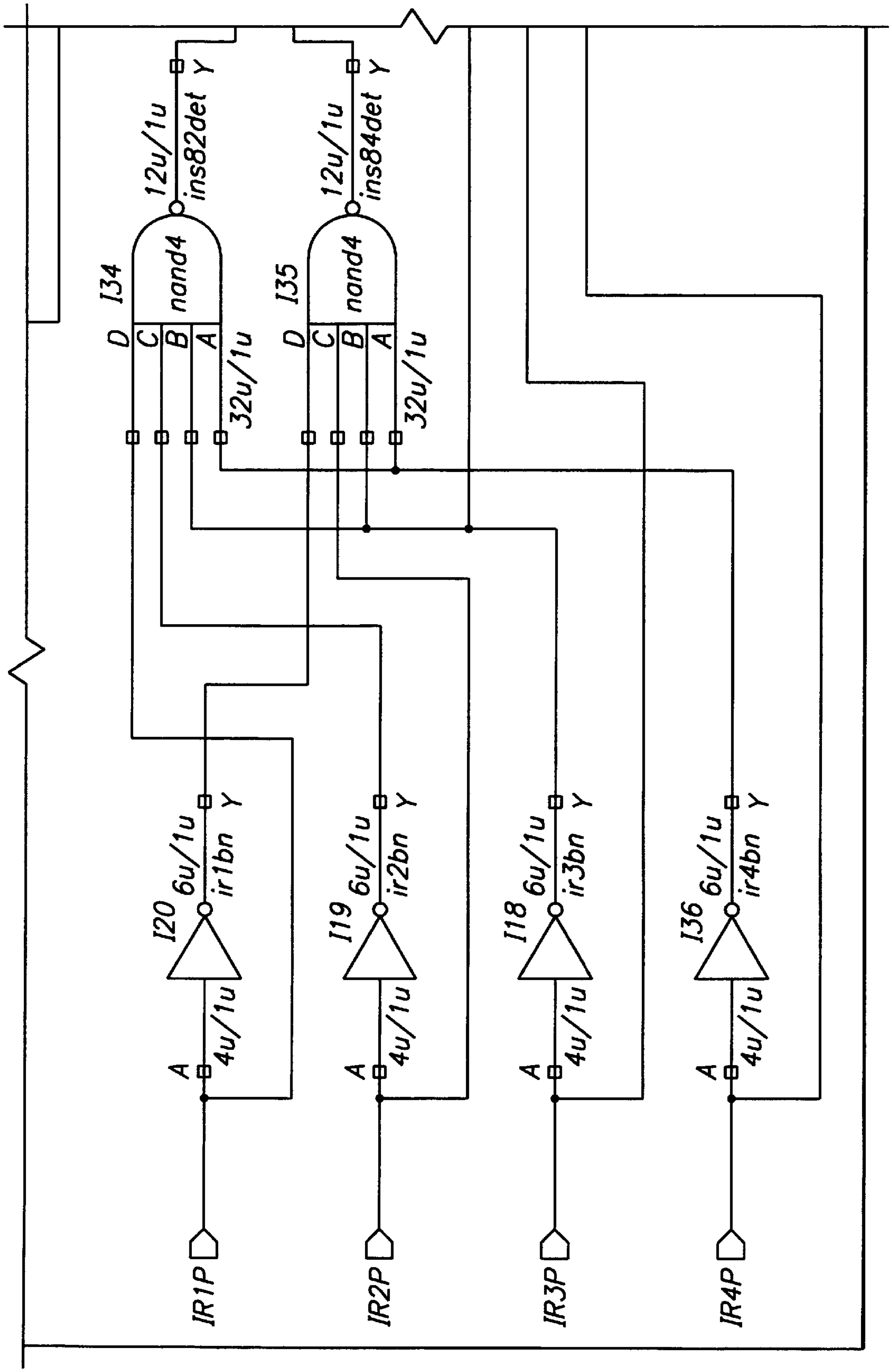
FIG. 7.07BA

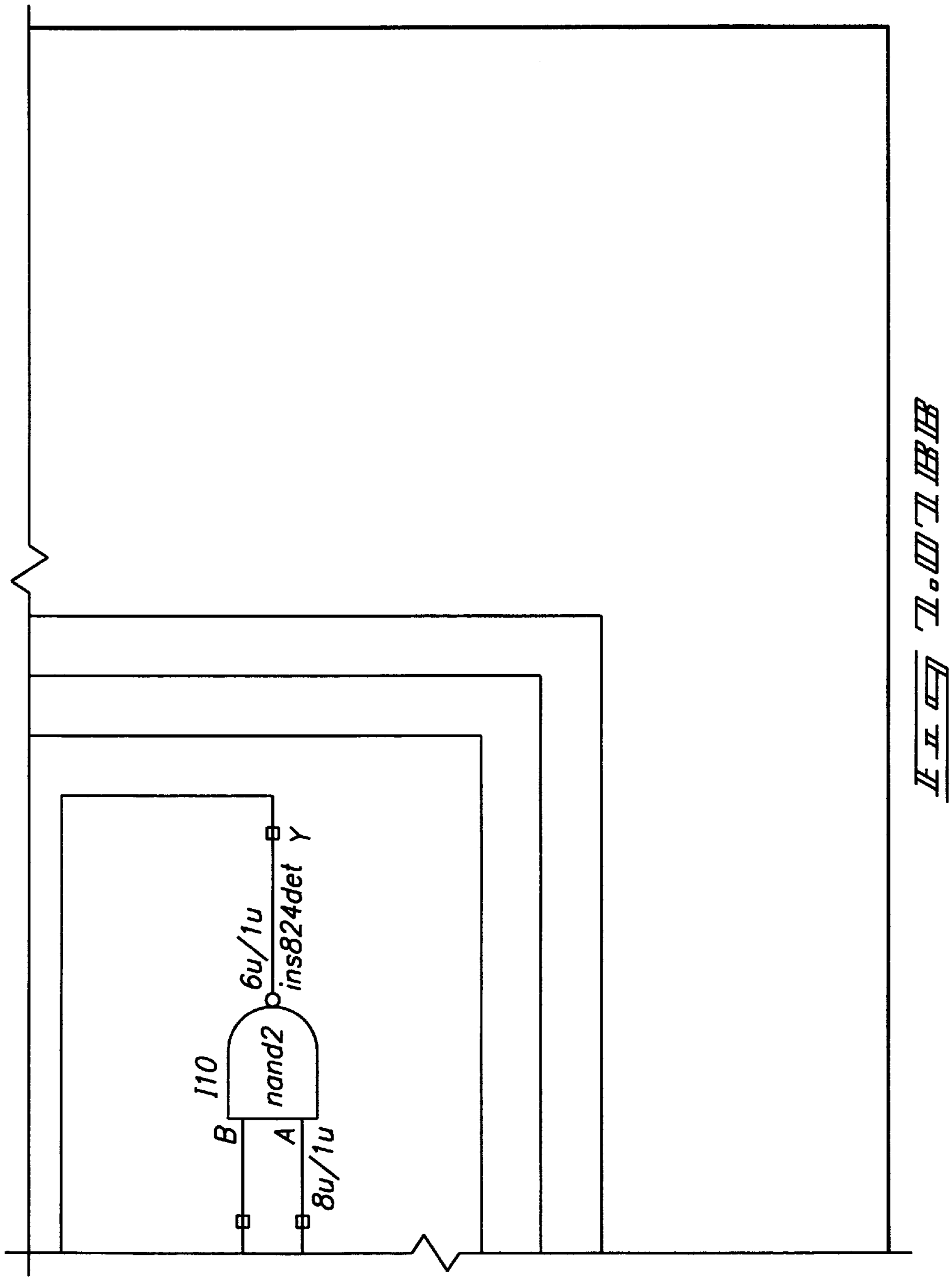
FIG. 7.07BB

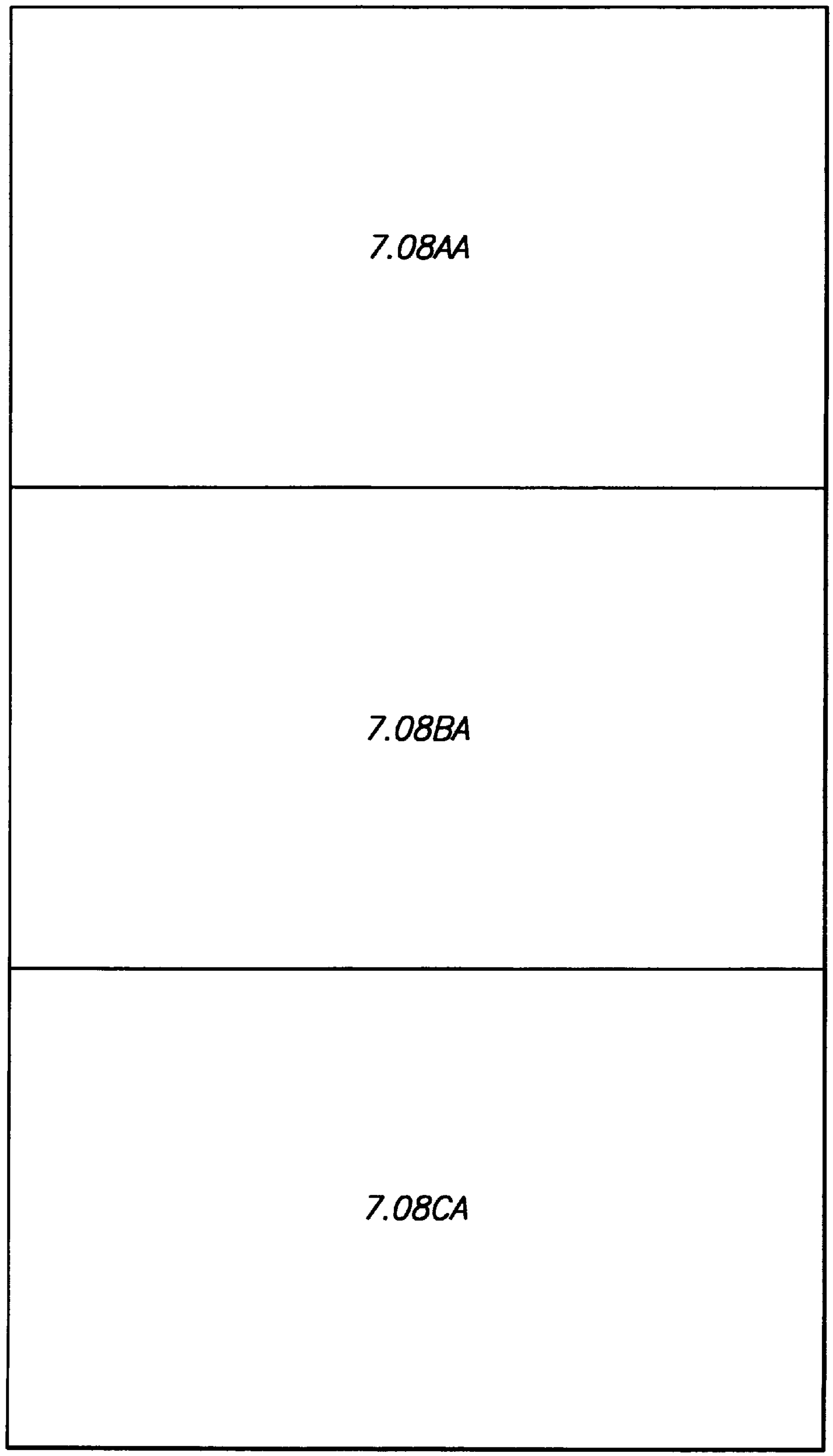
Fig. 7.08

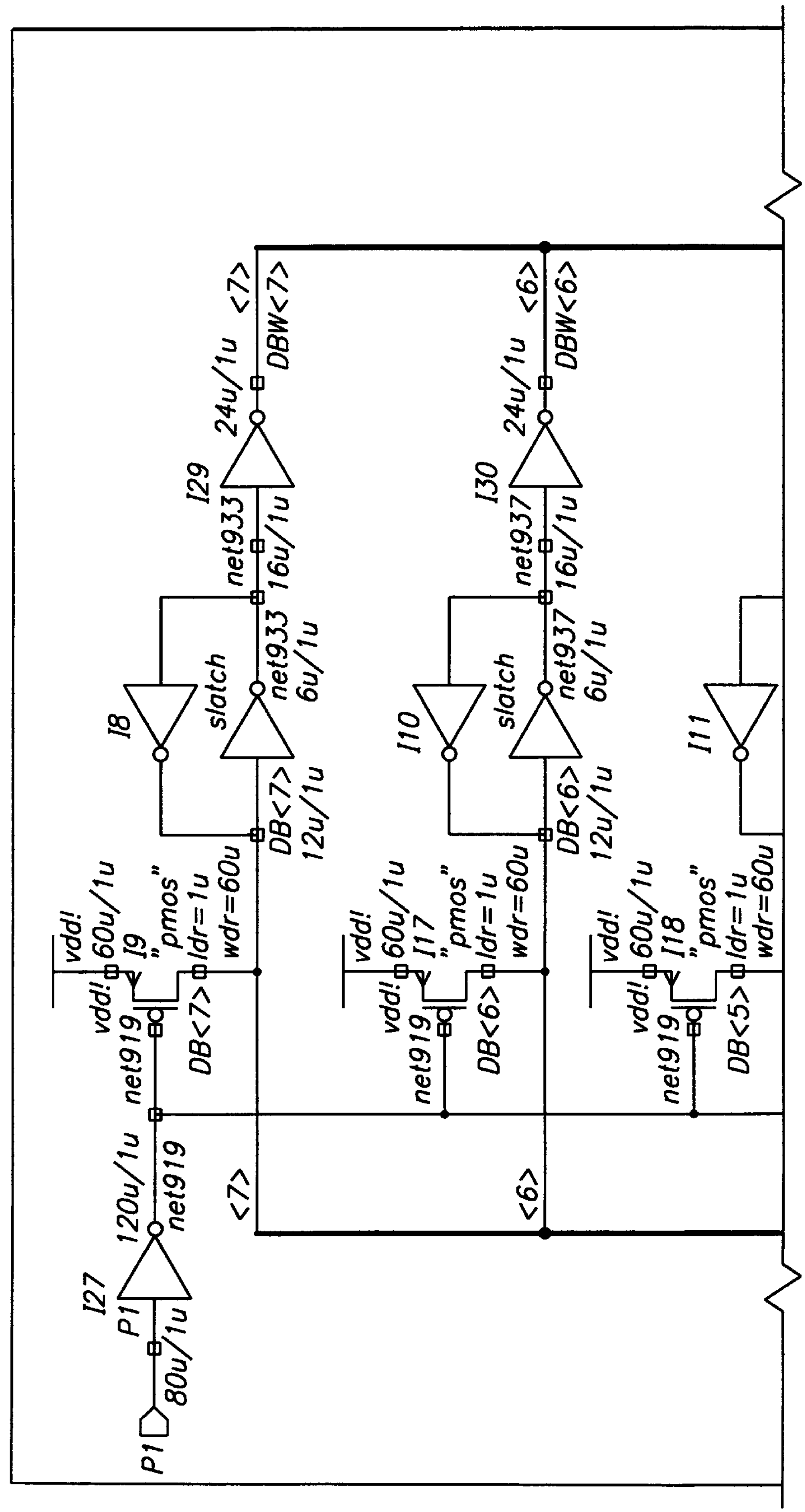
FIG. 7.08AA

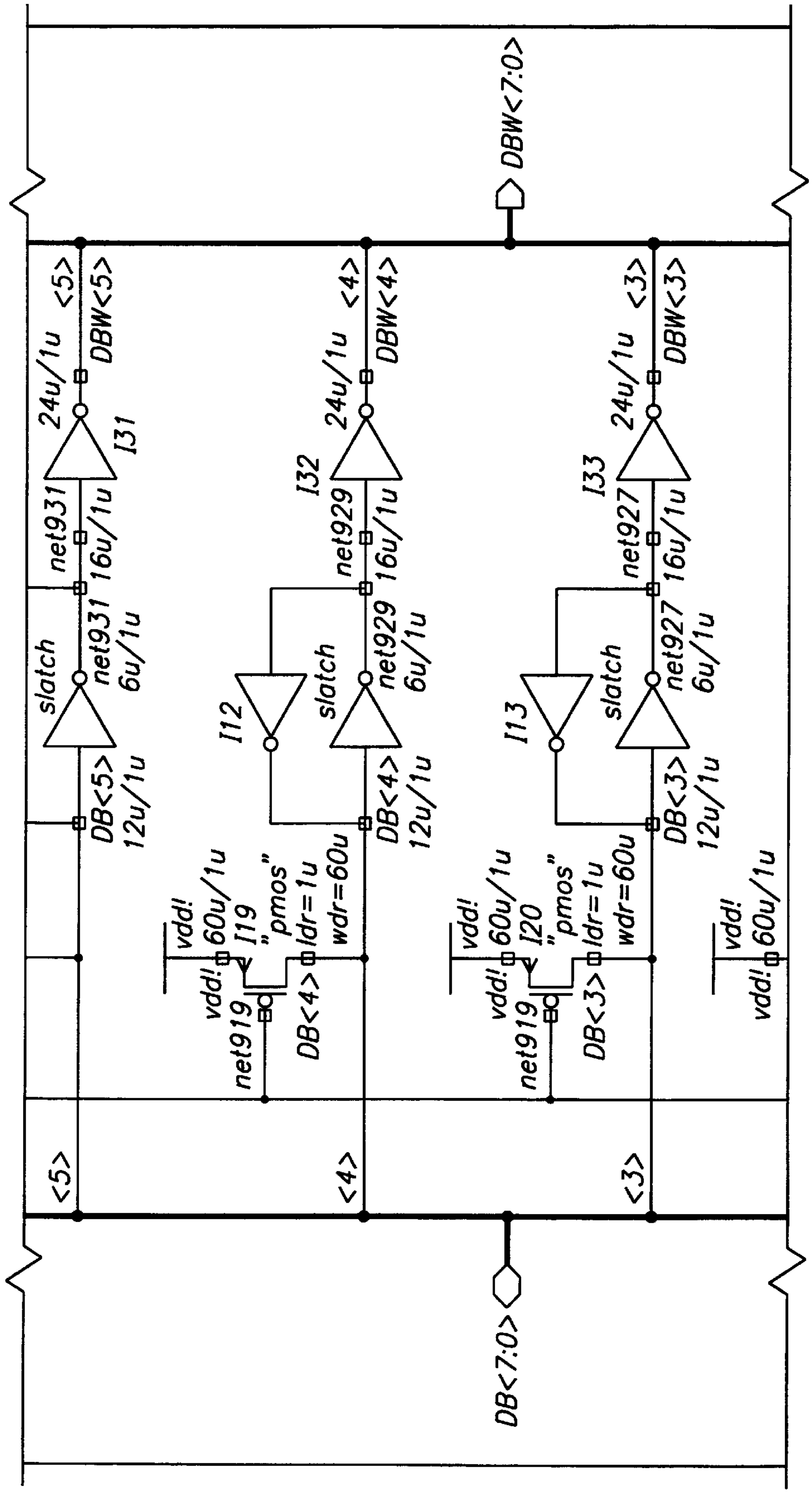
Fig. 7.08BA

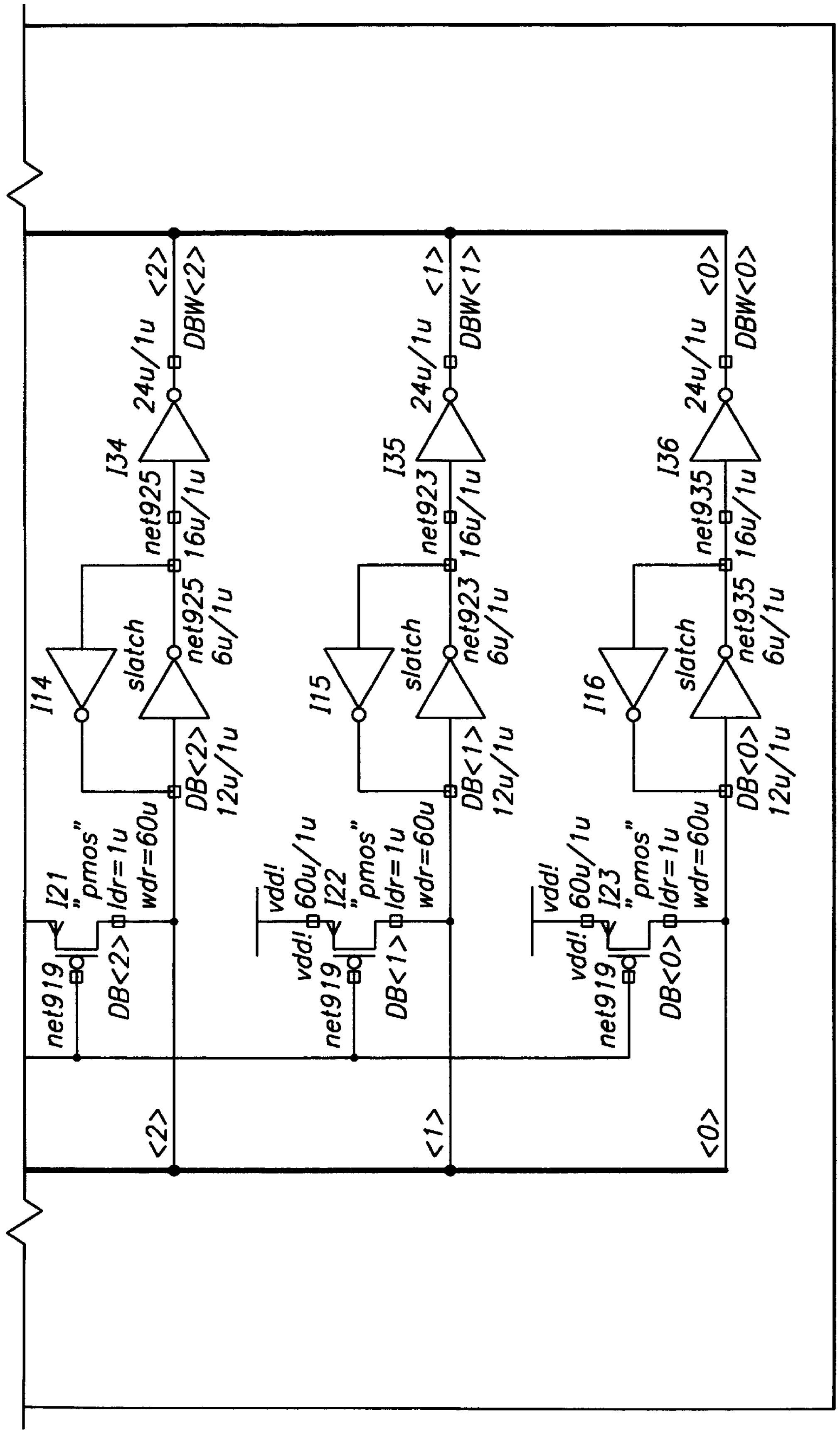
FIG. 7.08CA

| | | | | | |
|---|---|---|---|---|---|
| 7.09AA | 7.09AB | 7.09AC | 7.09AD | 7.09AE | 7.09AF |
| 7.09BA | 7.09BB | 7.09BC | 7.09BD | 7.09BE | 7.09BF |

Fig 7.09

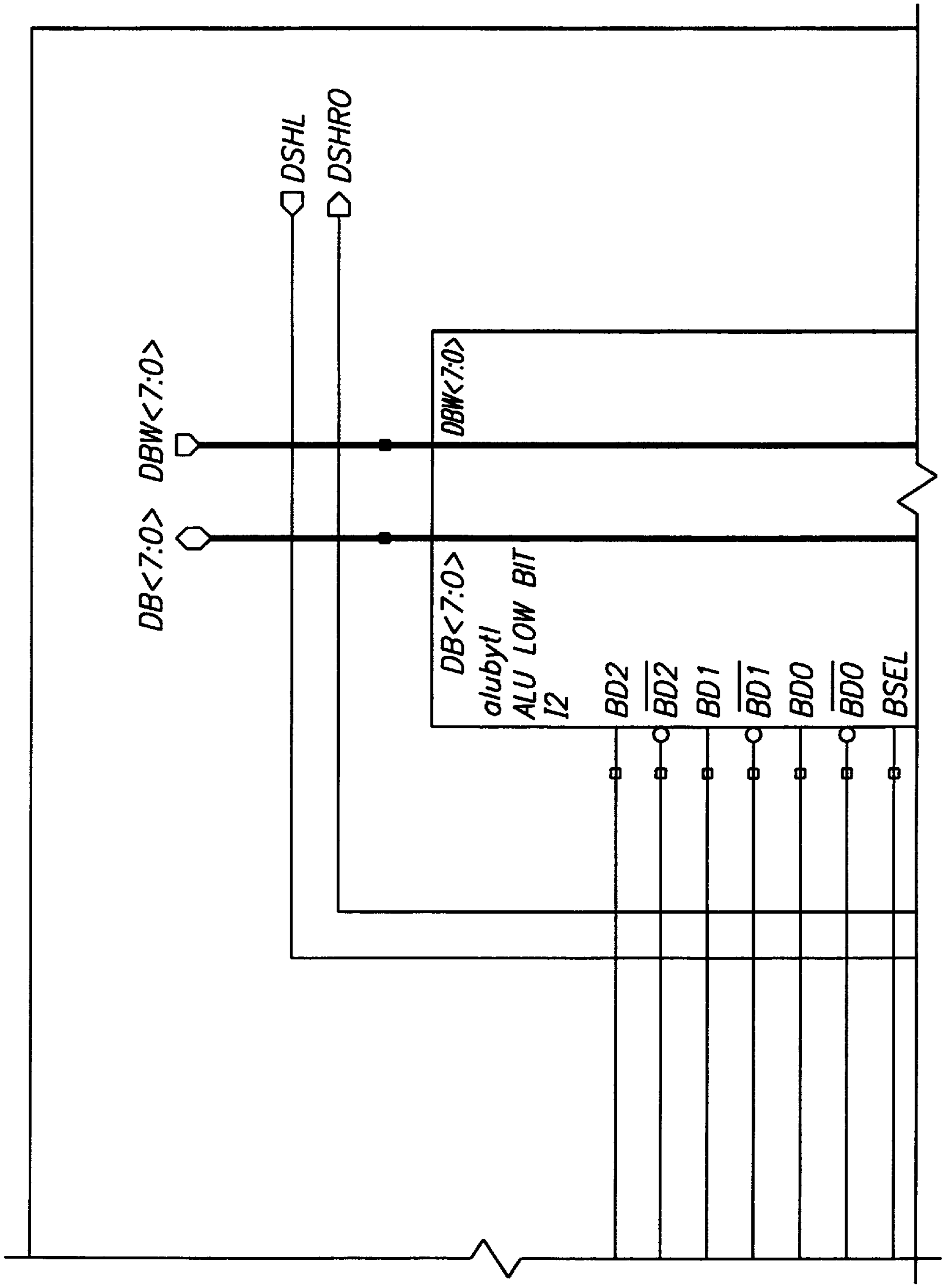
FIG. 7.09AA

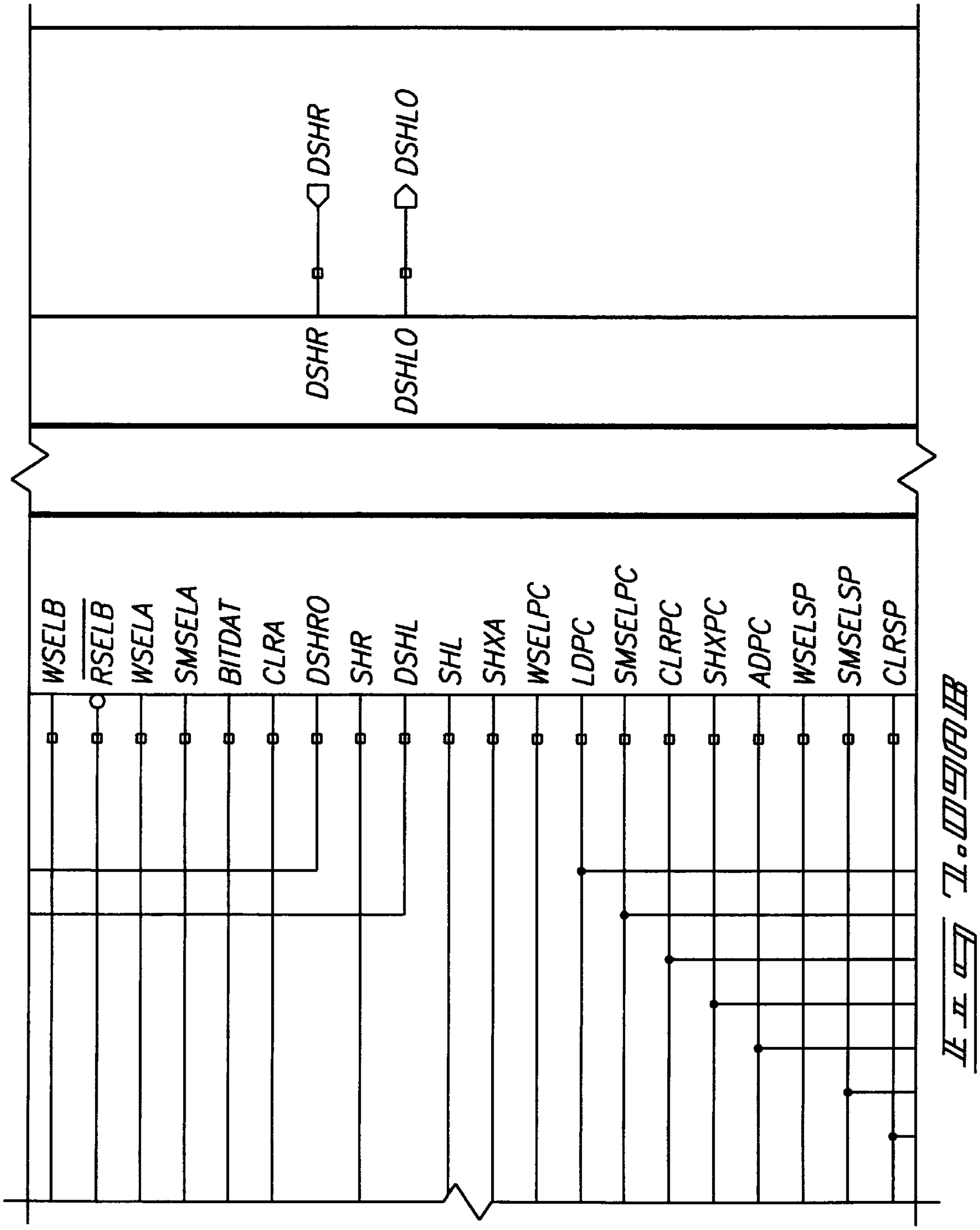
FIG. 7.09AB

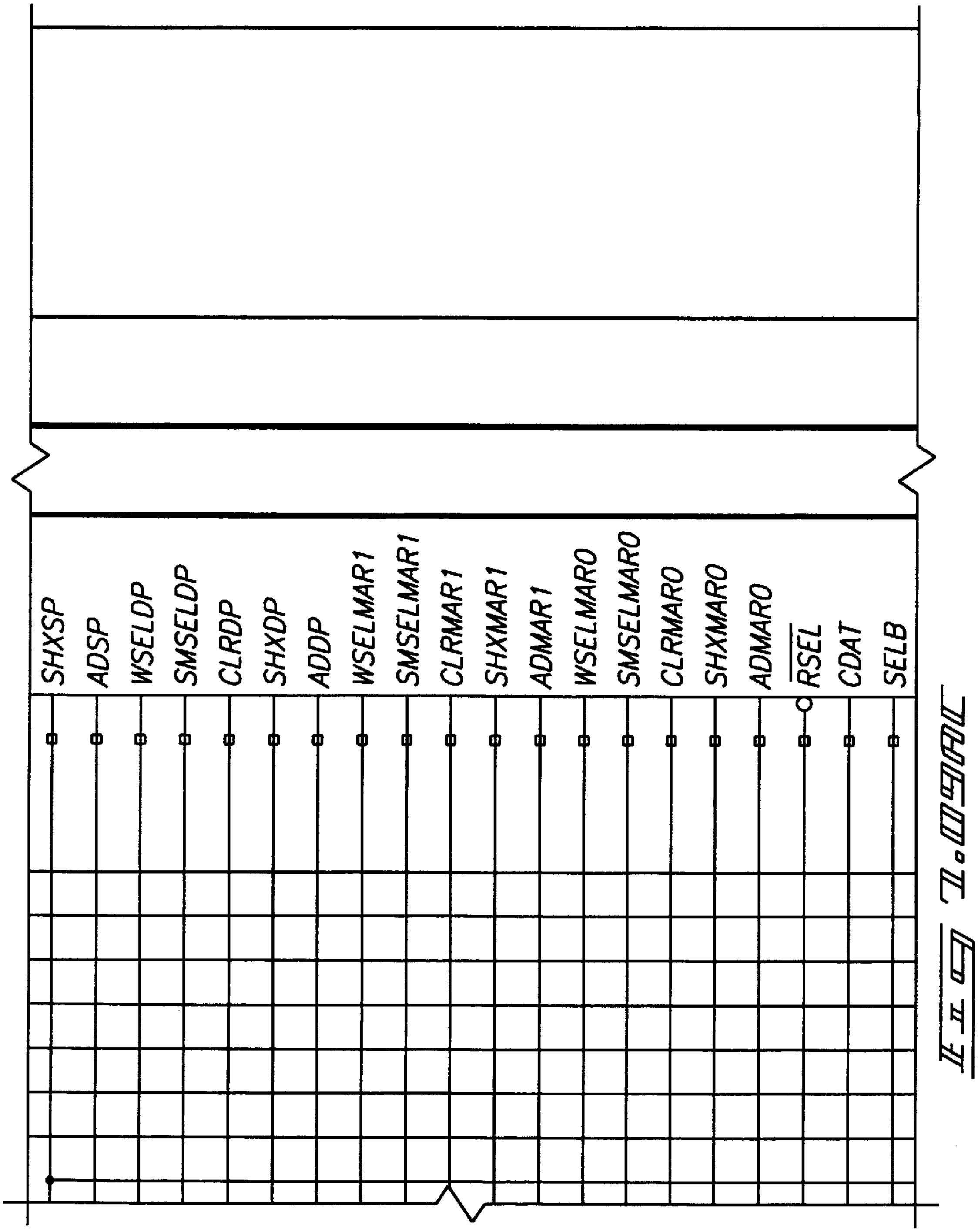
Fig. 7.09AC

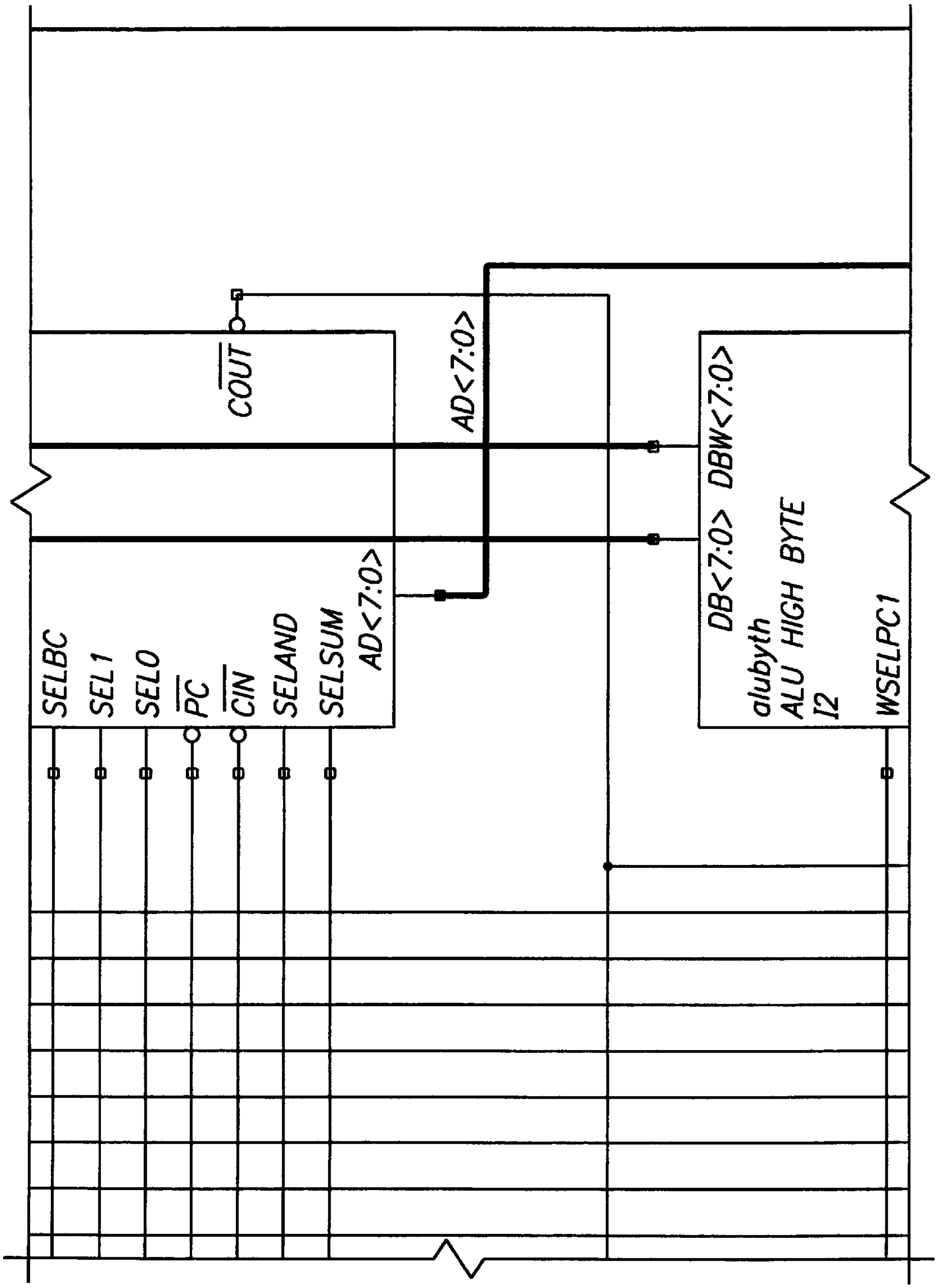
FIG. 7.09AD

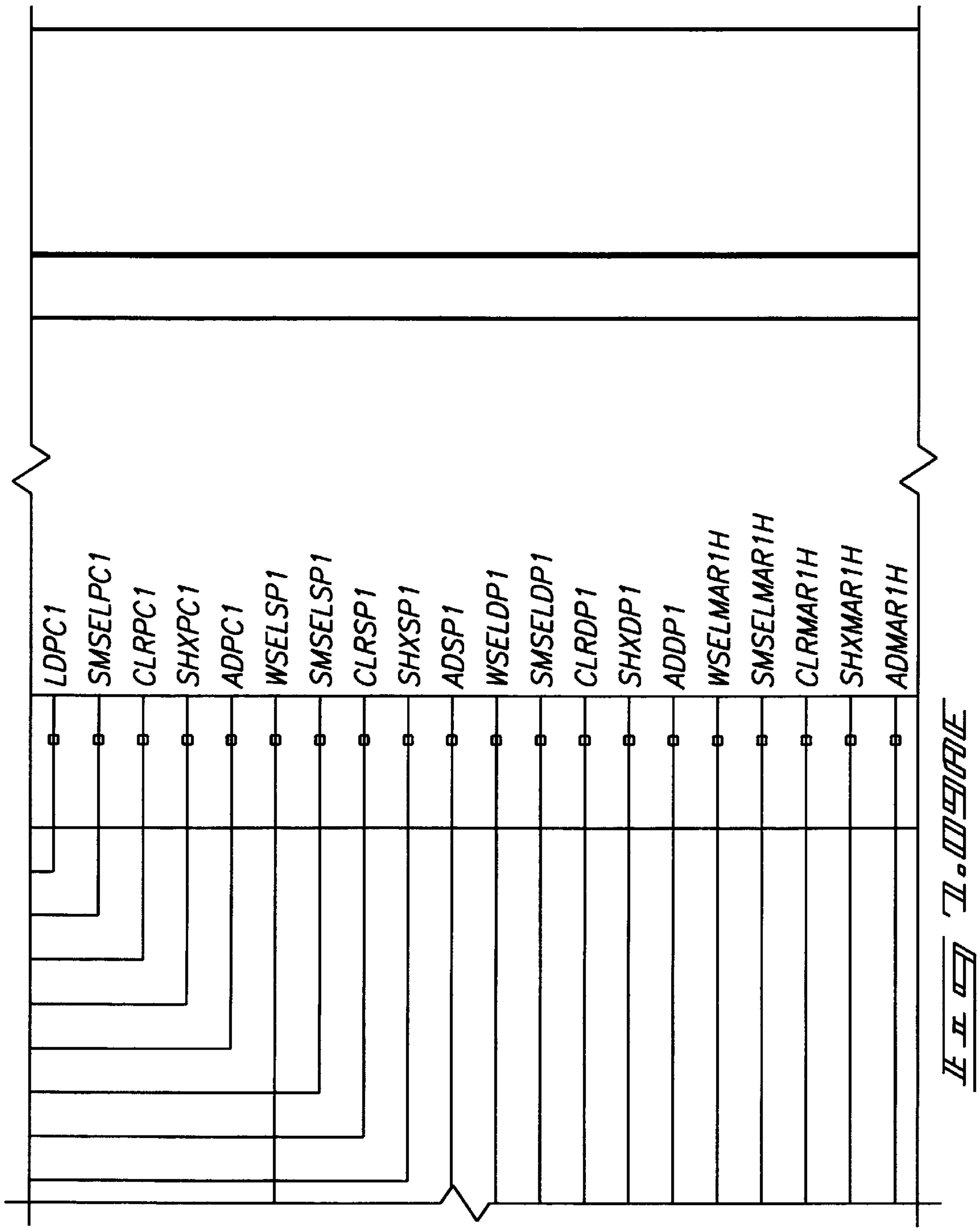
Fig. 7.09AE

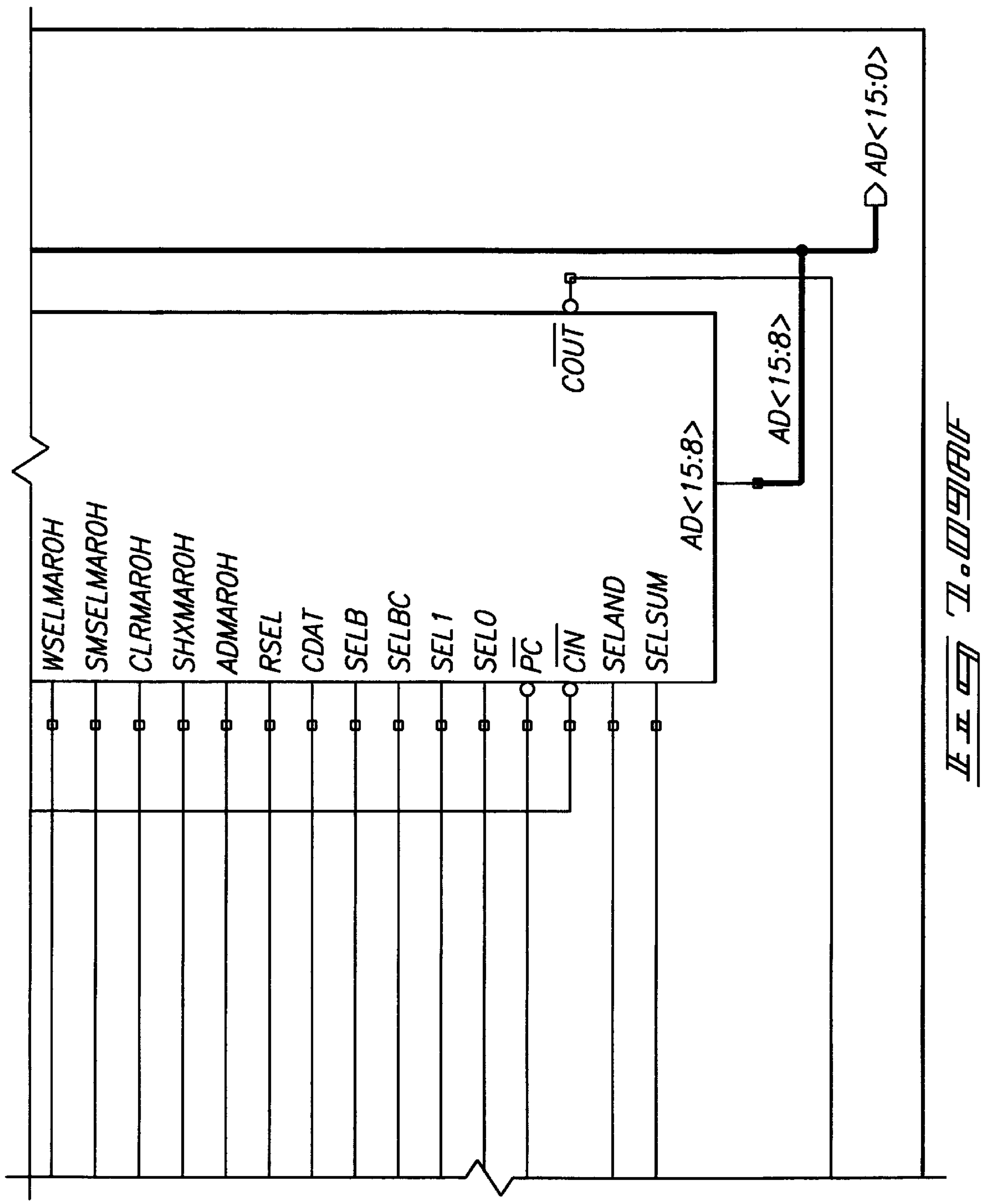
FIG. 7.09AF

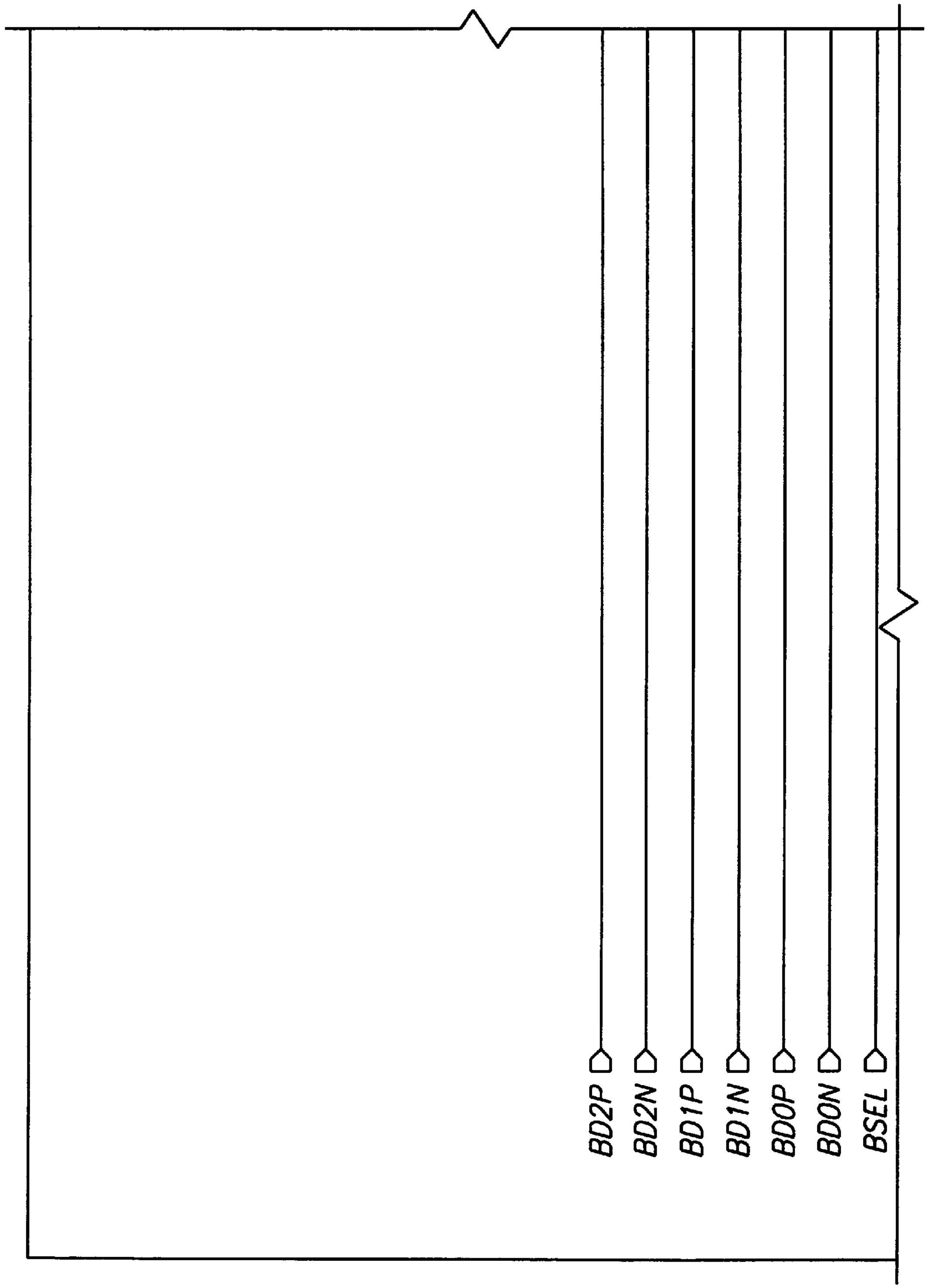
FIG. 7.098A

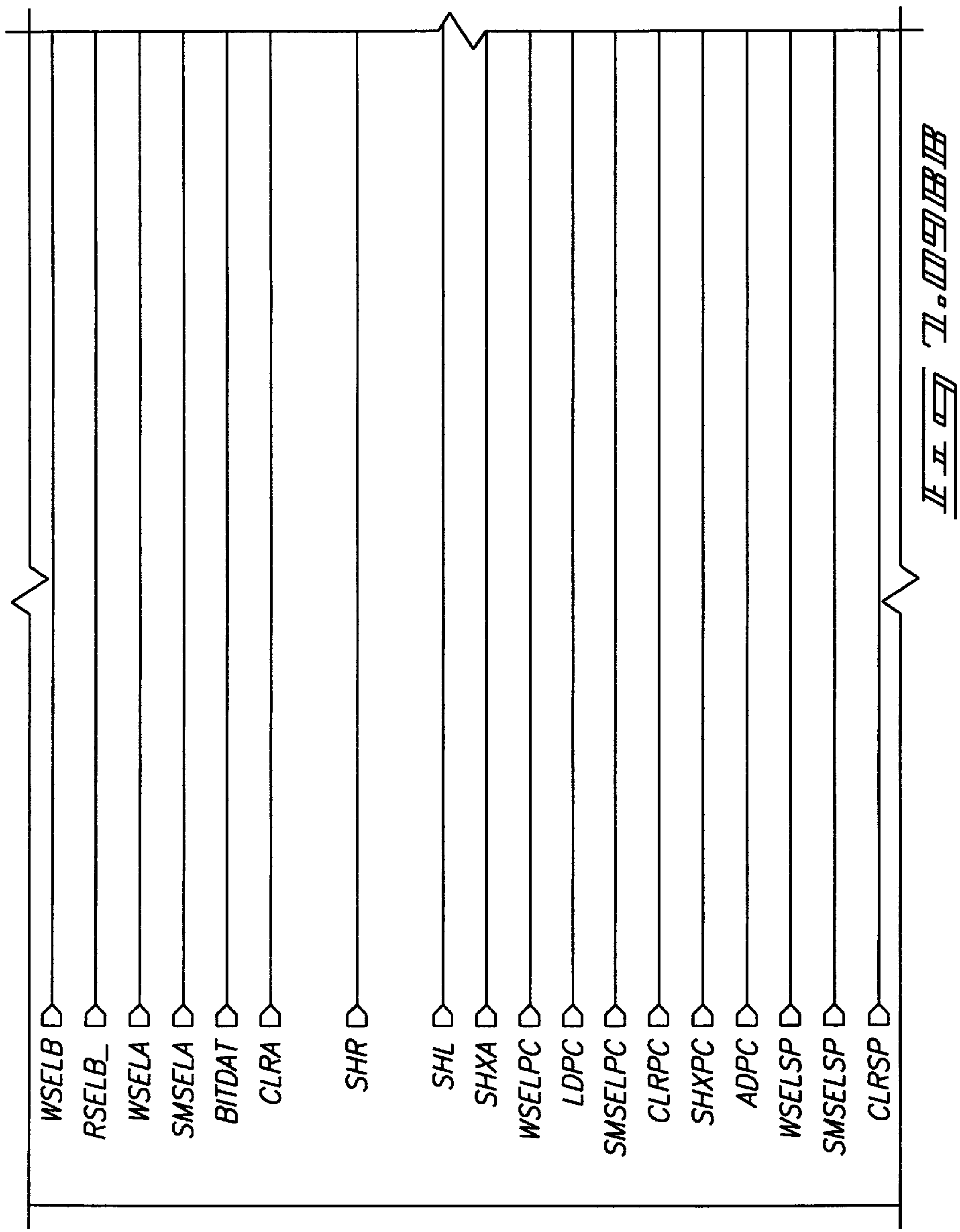
FIG. 7.09B

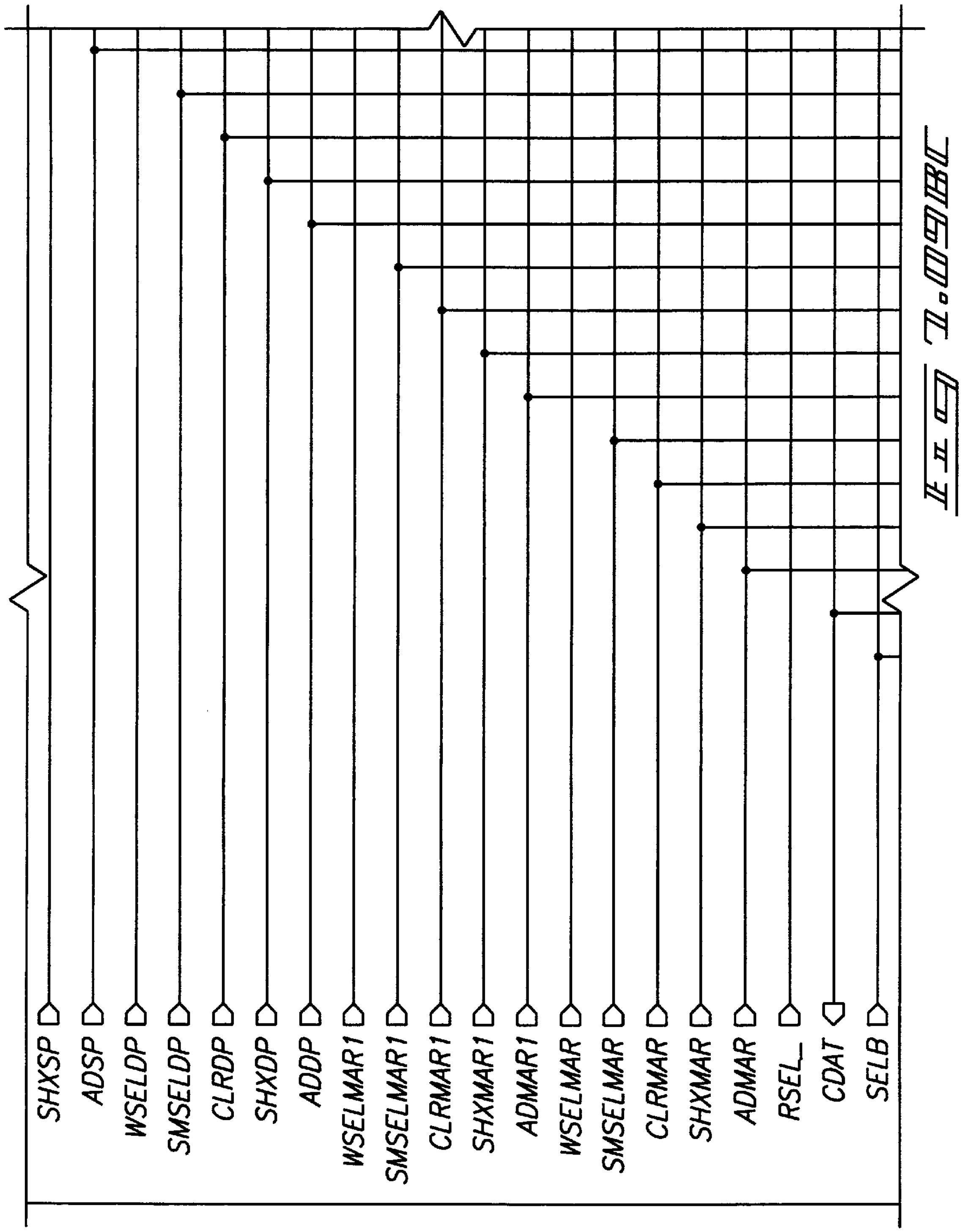
FIG. 7.09BC

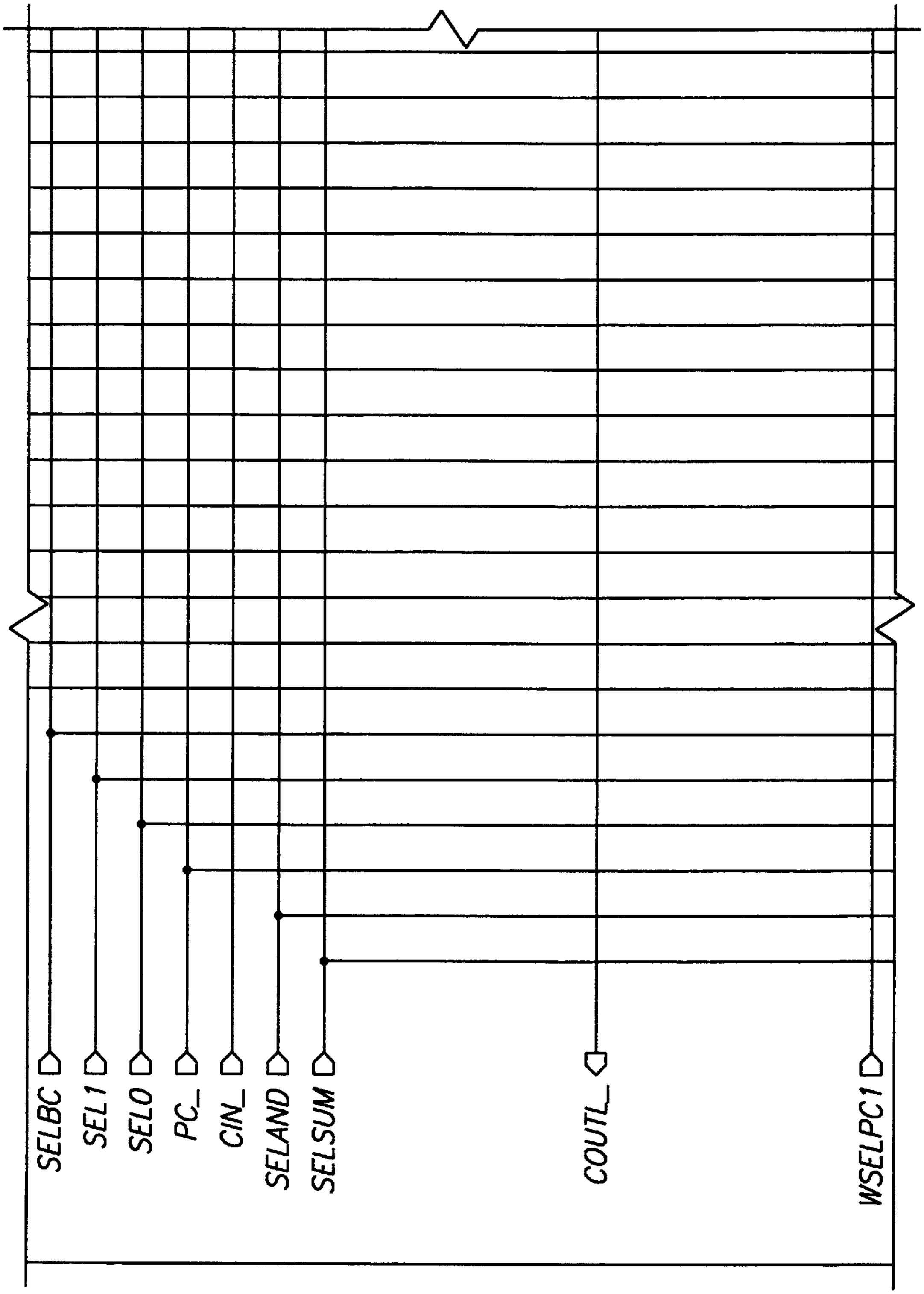
FIG. 7.09BD

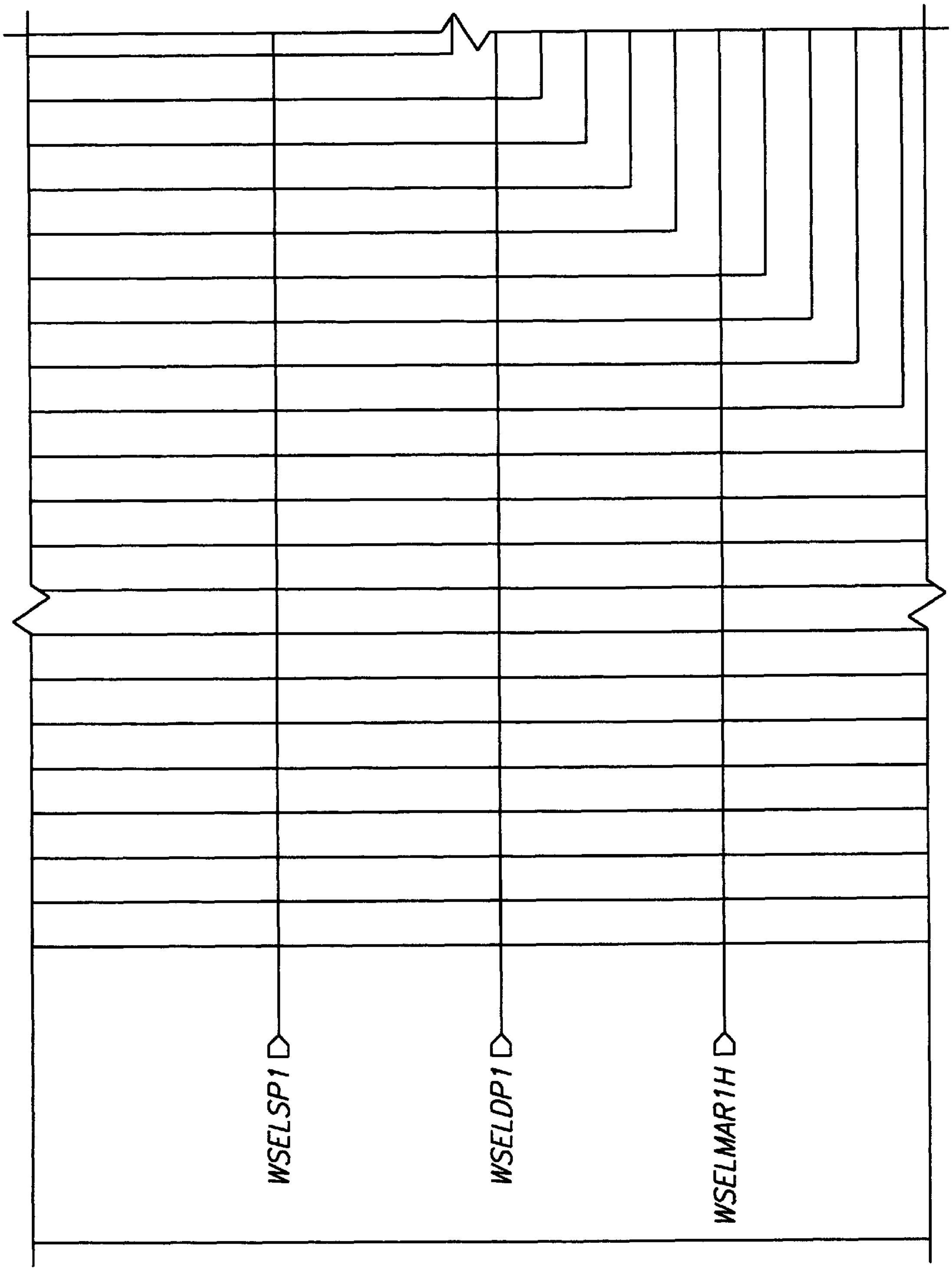
FIG. 7.09BE

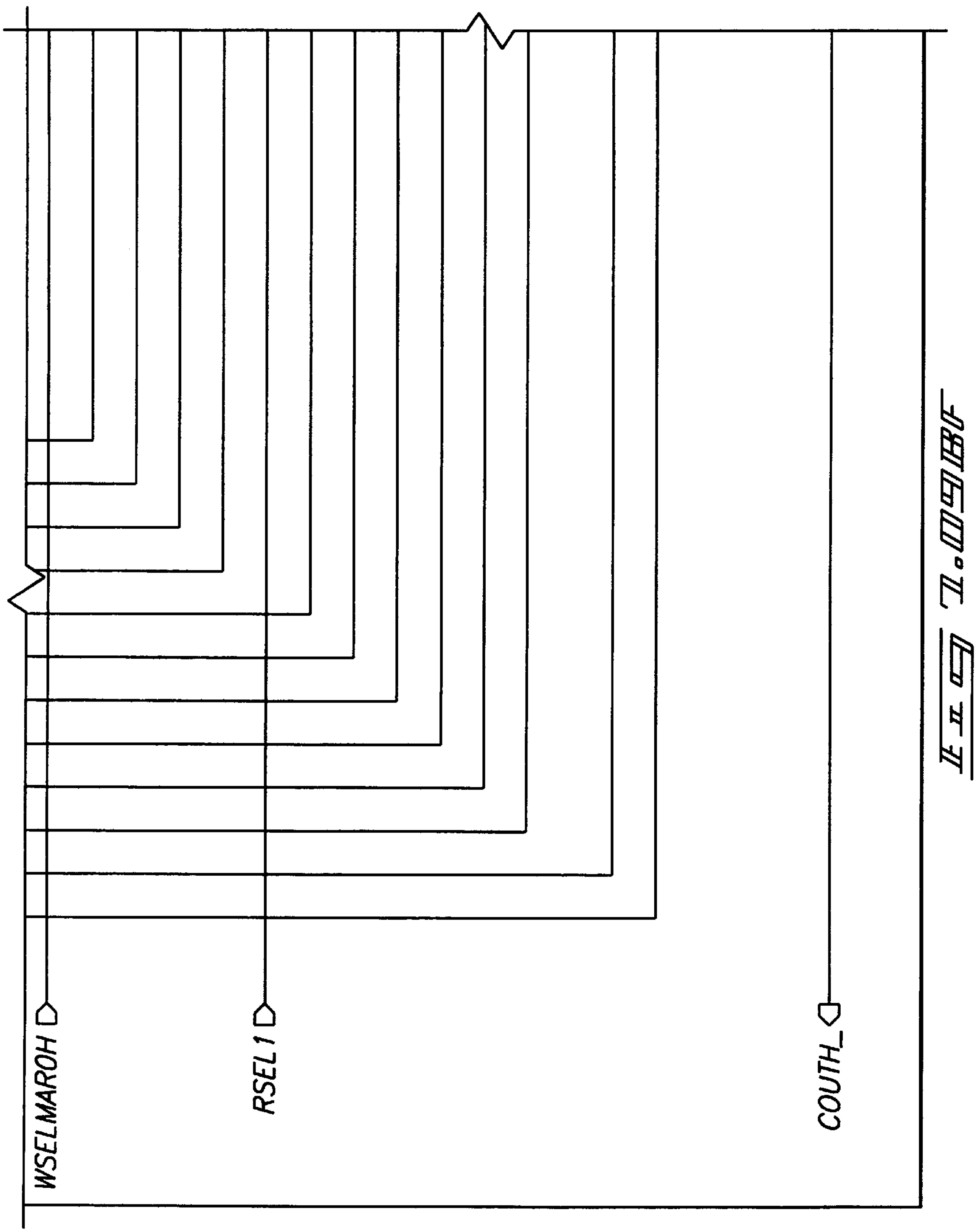
FIG. 7.09BF

| | | | | |
|---|---|---|---|---|
| 7.0901AA | 7.0901AB | 7.0901AC | 7.0901AD | 7.0901AE |
| 7.0901BA | 7.0901BB | 7.0901BC | 7.0901BD | 7.0901BE |
| 7.0901CA | 7.0901CB | 7.0901CC | 7.0901CD | 7.0901CE |

FIG 7.0901

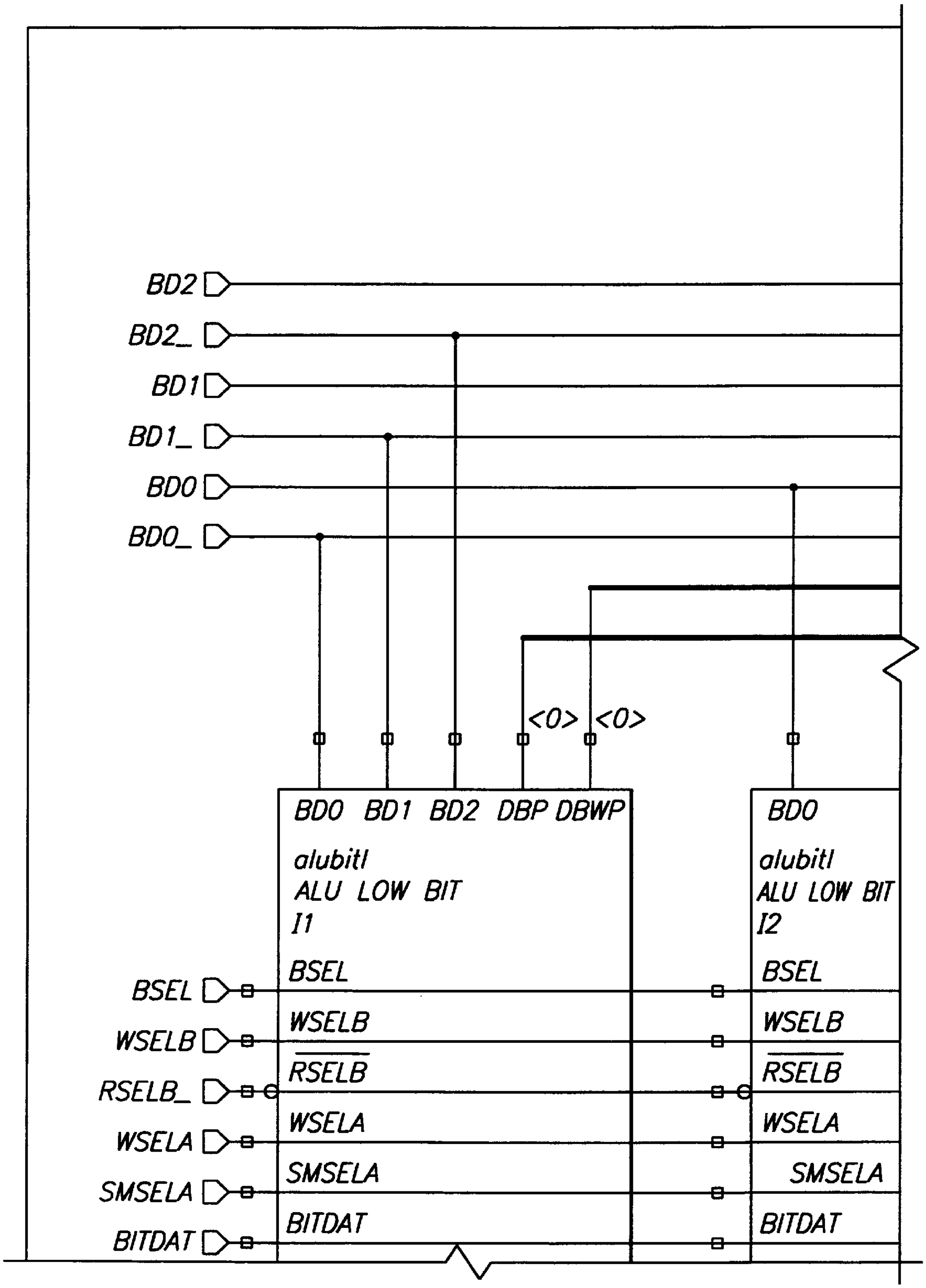
Fig 1.0901AA

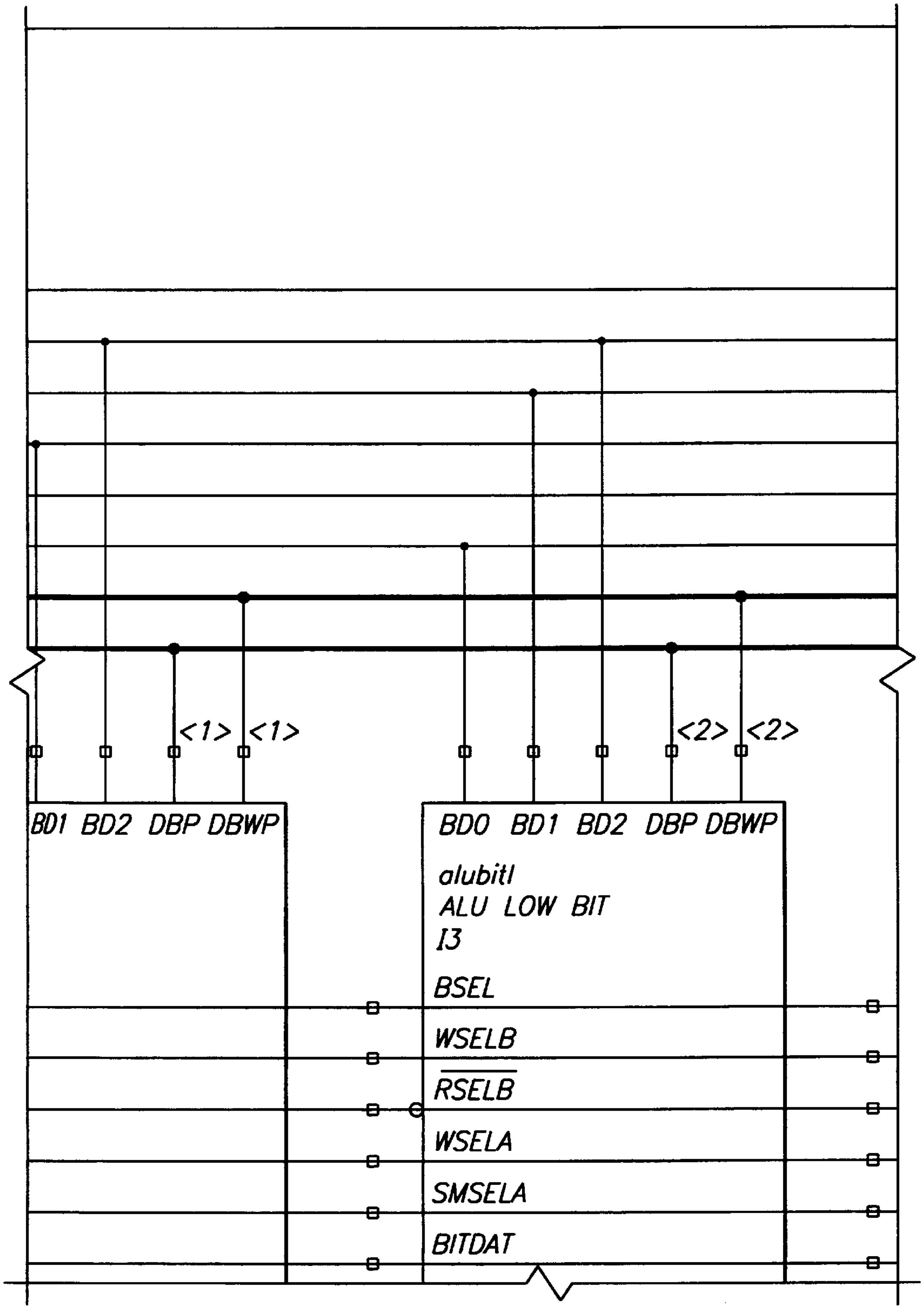
FIG 1.0901AB

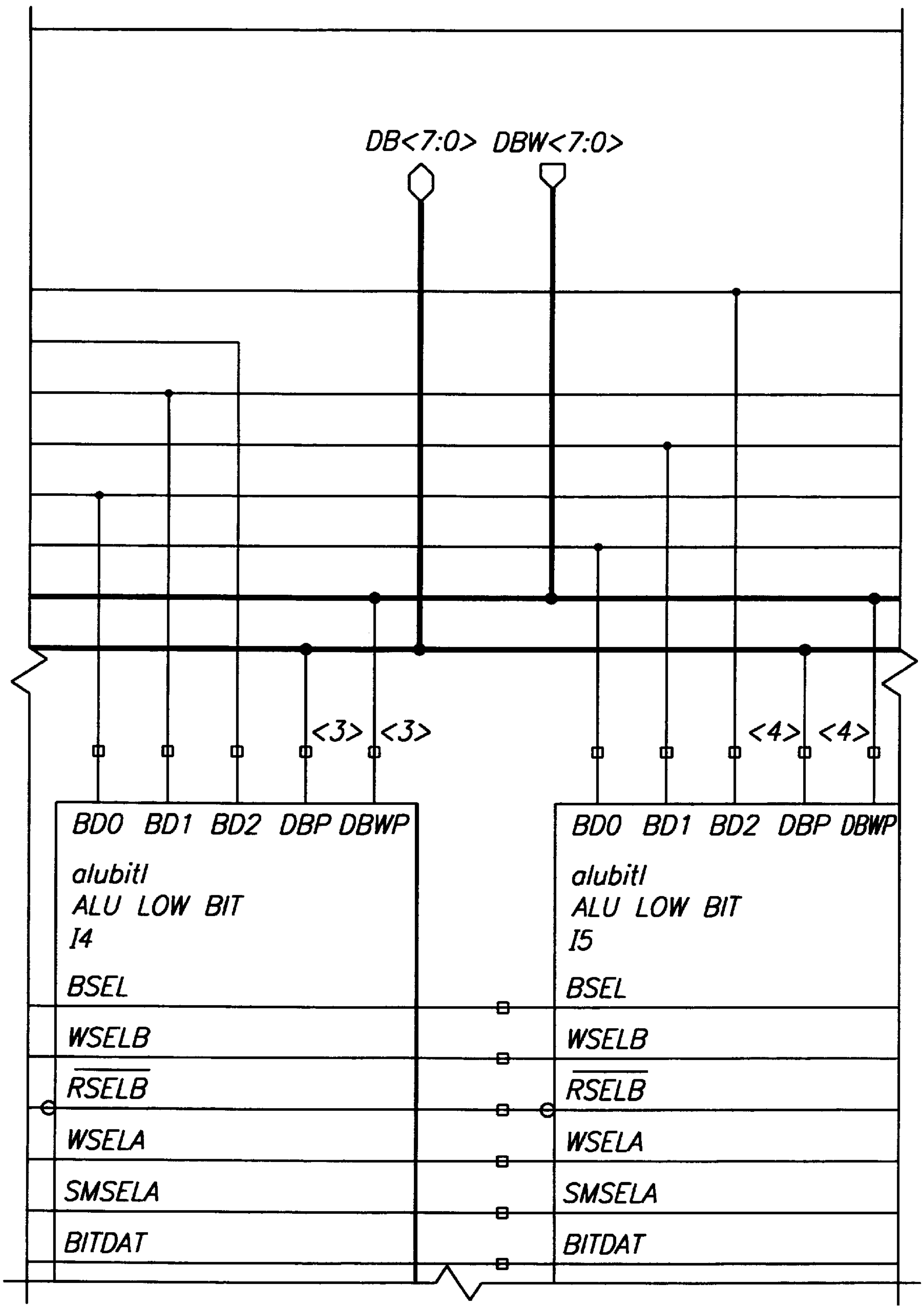
Fig 7.0901AC

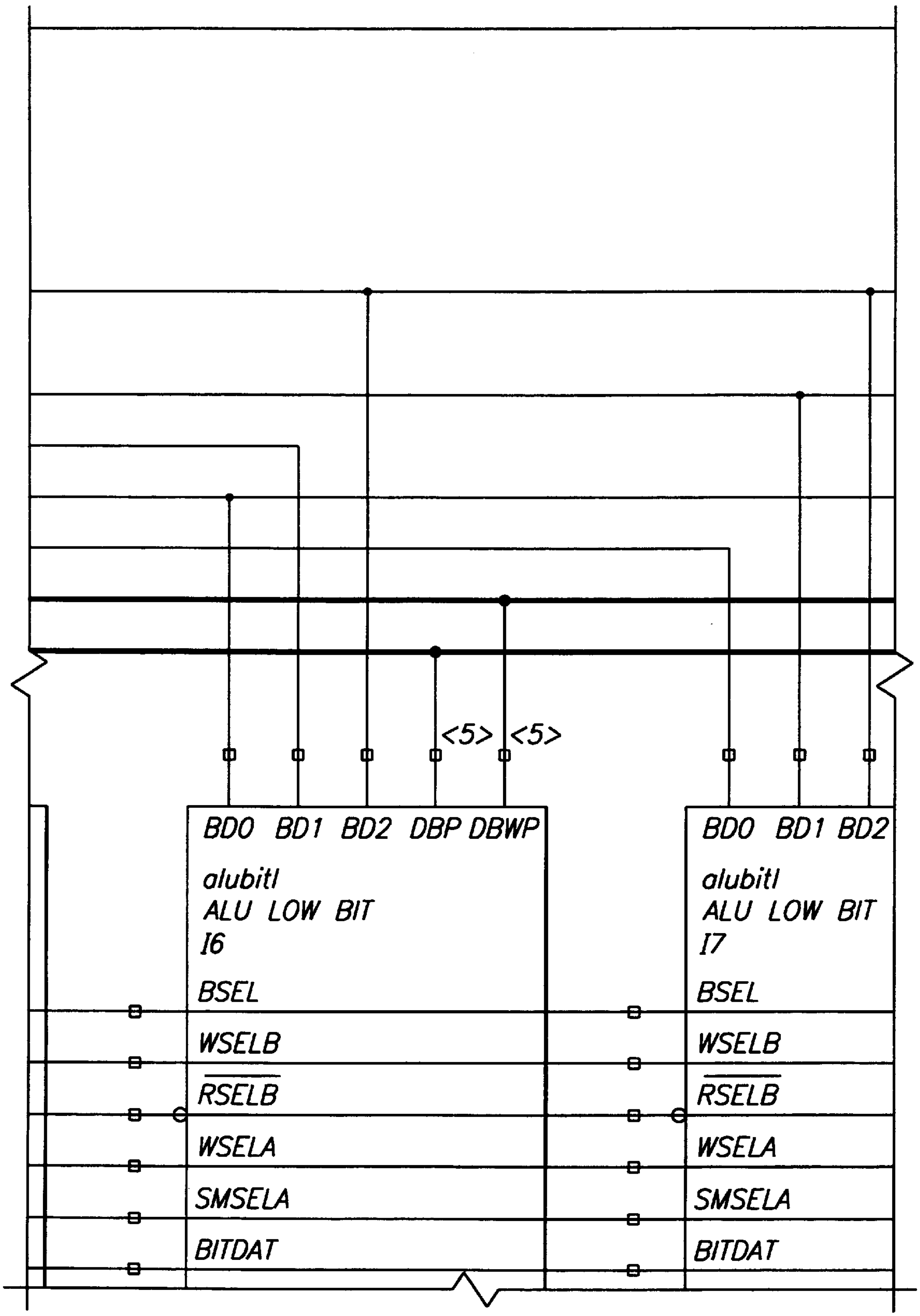
FIG 1.0901AD

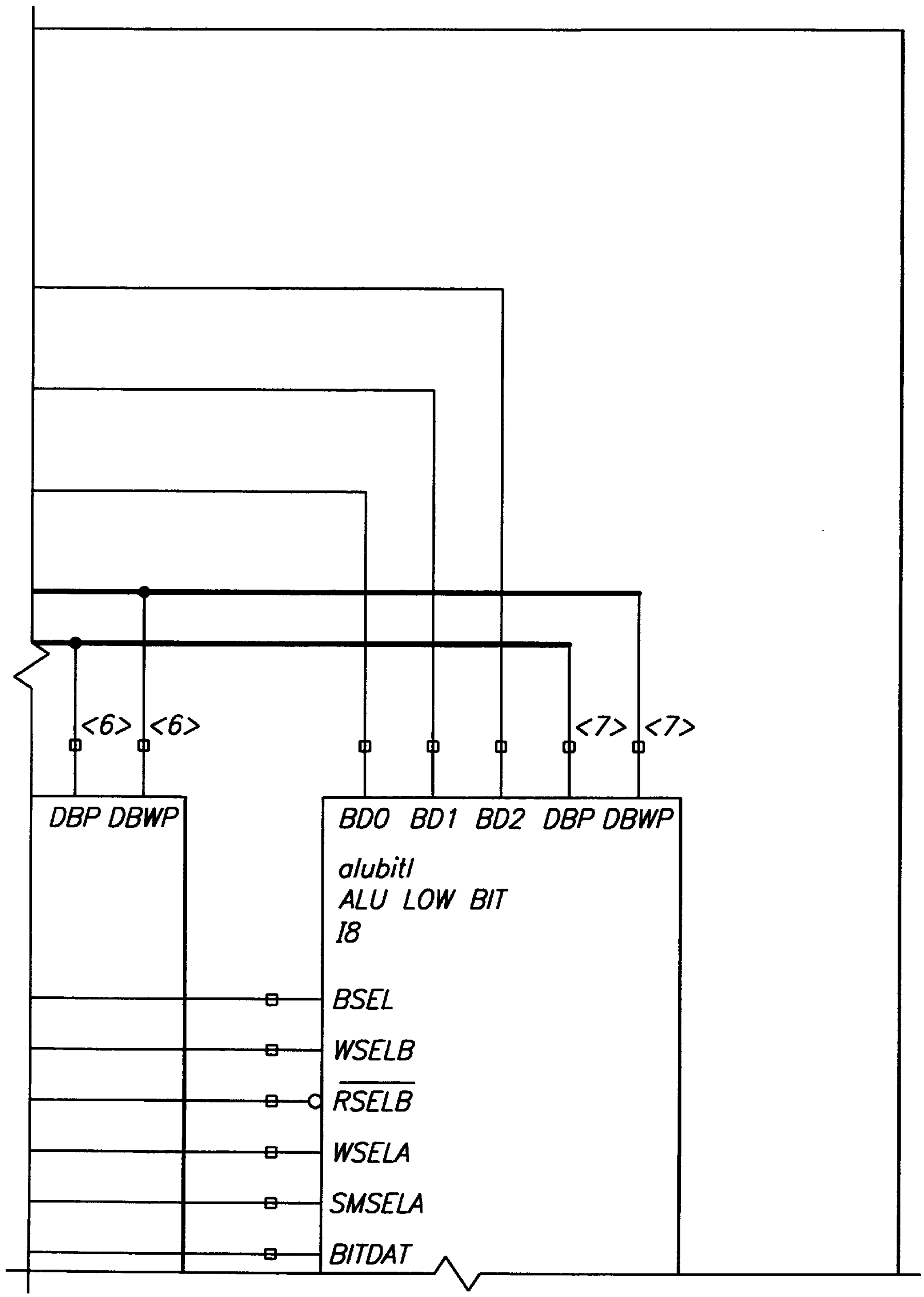
Fig. 7.0901AE

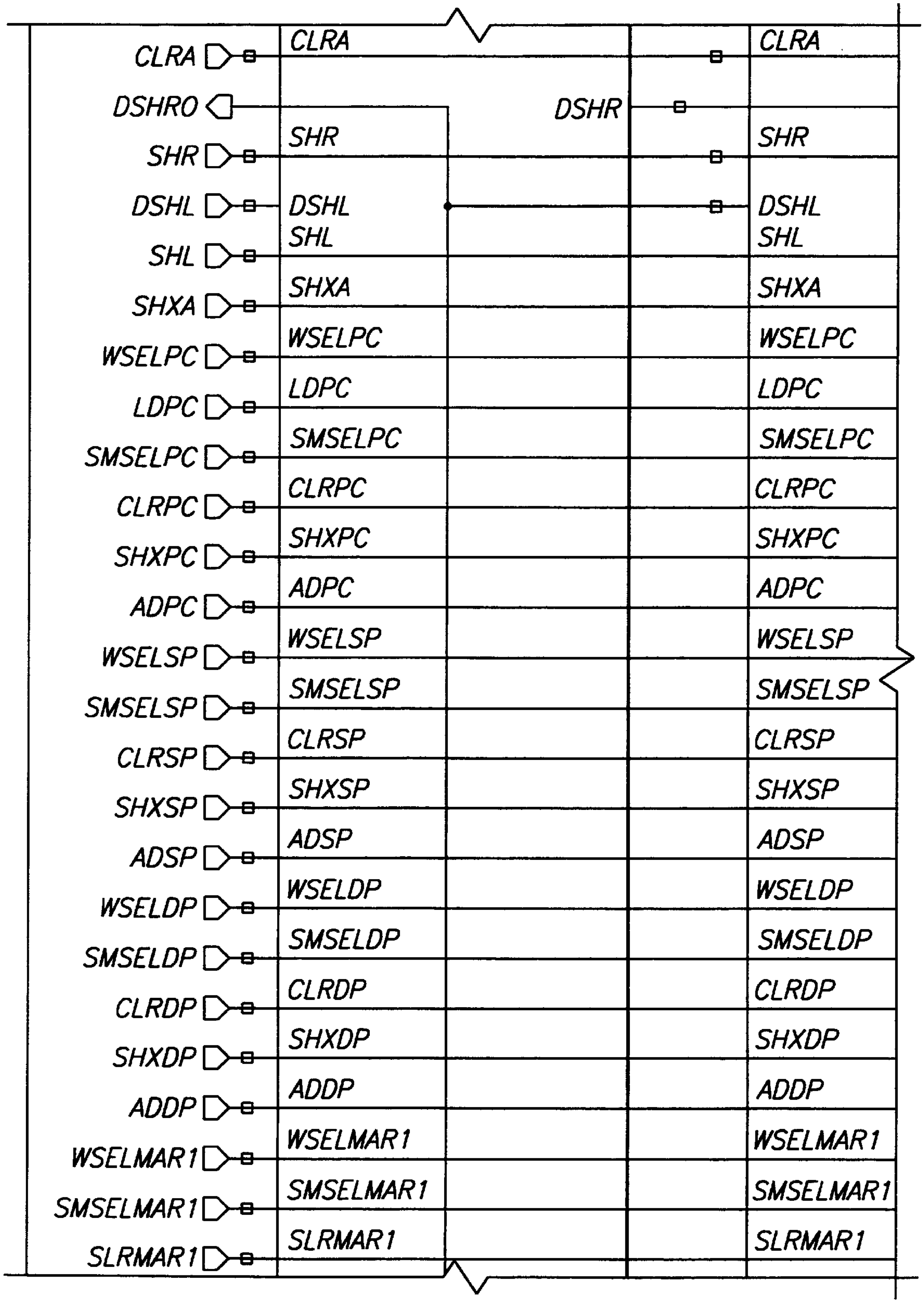
Fig 7.09018A

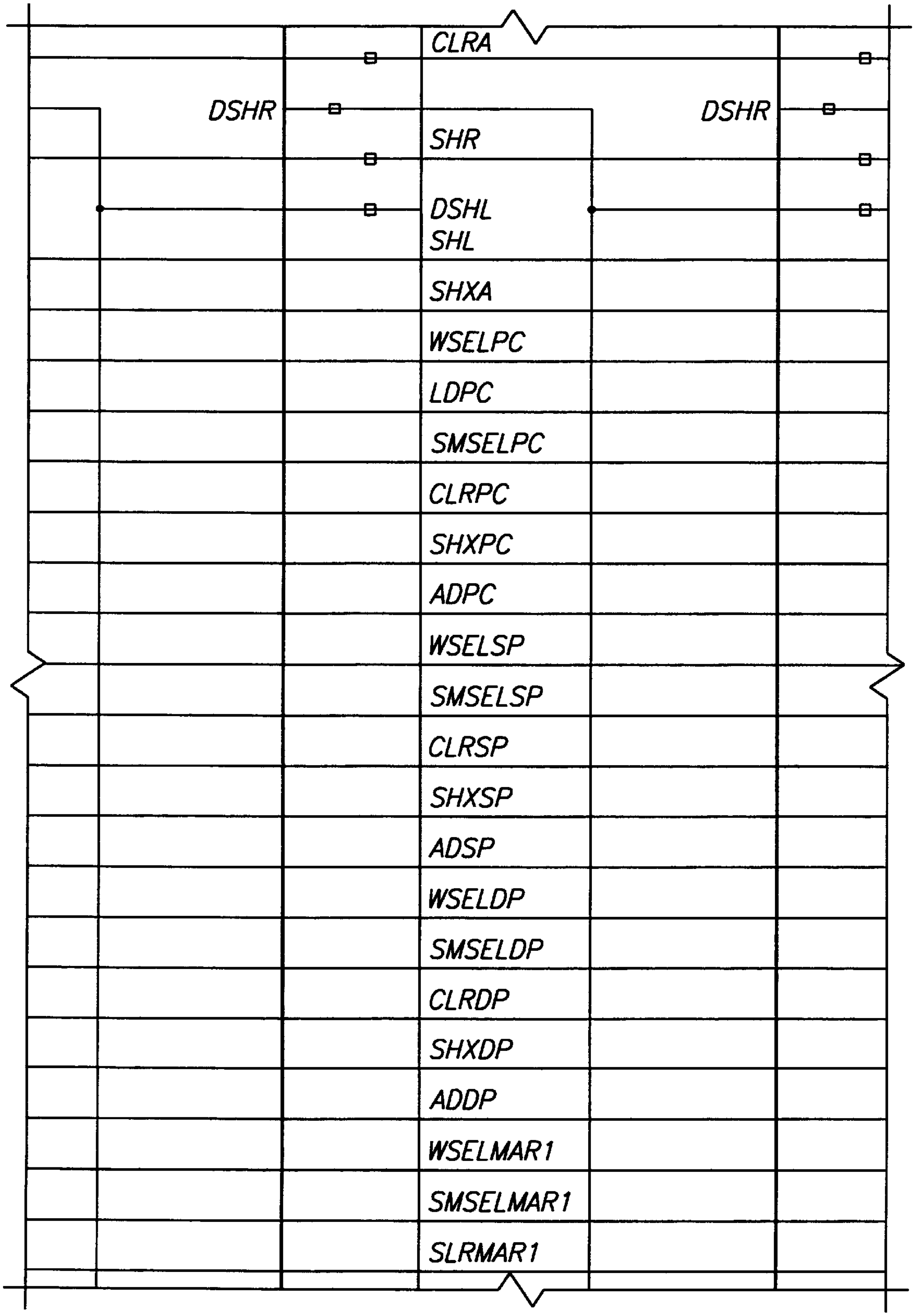
Fig 7.0901BB

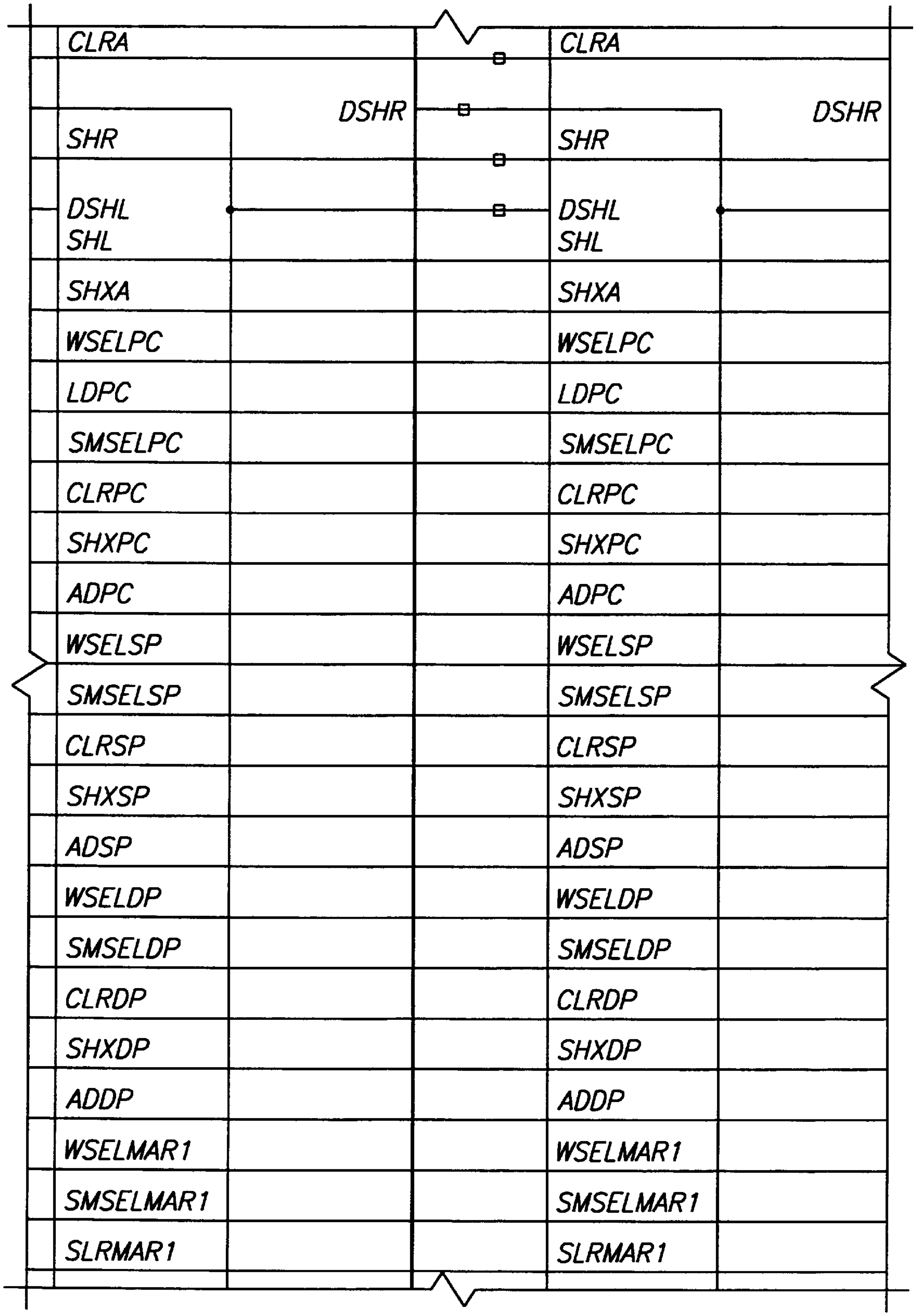
Fig 7.0901BC

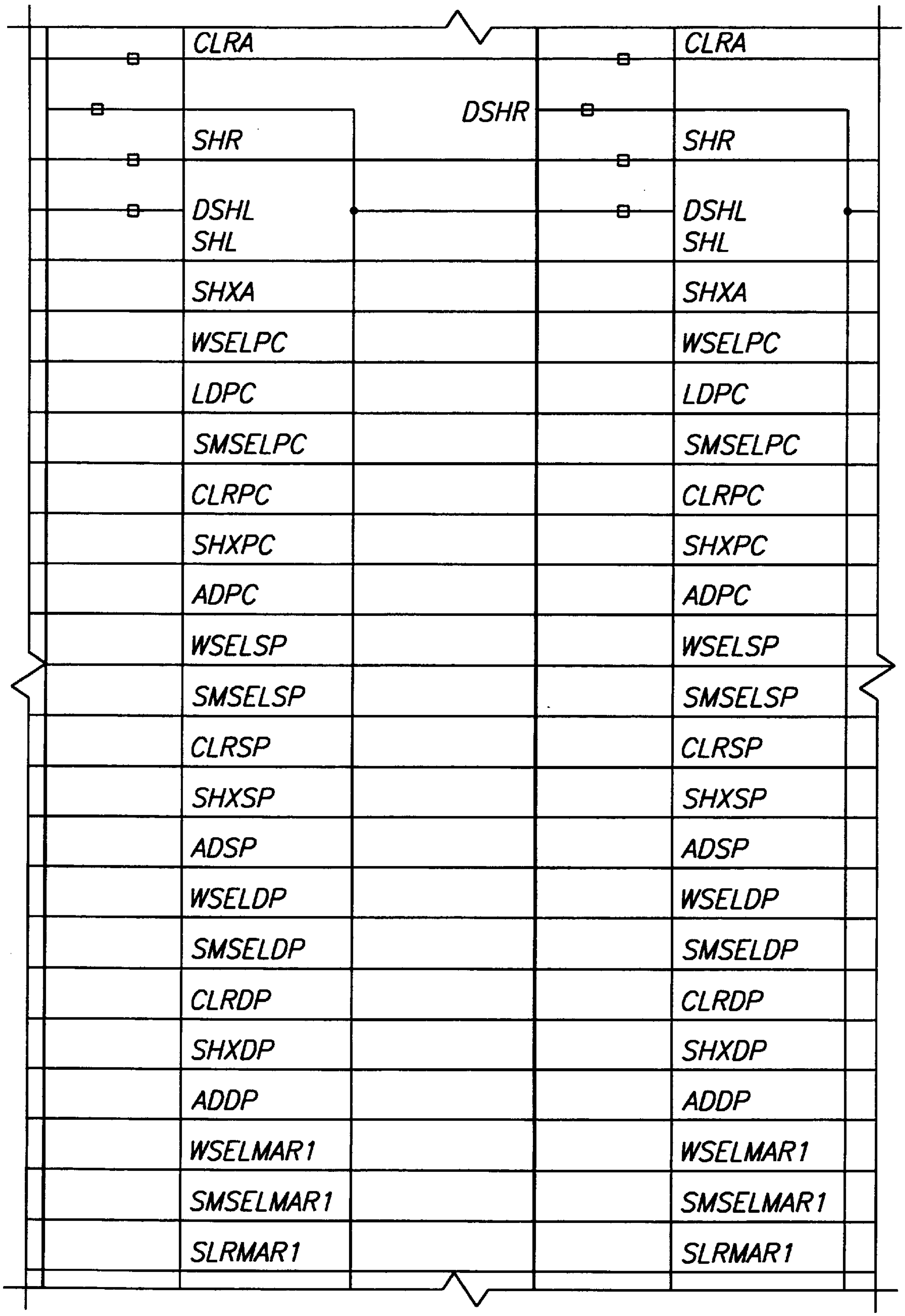
Fig 1.0901BD

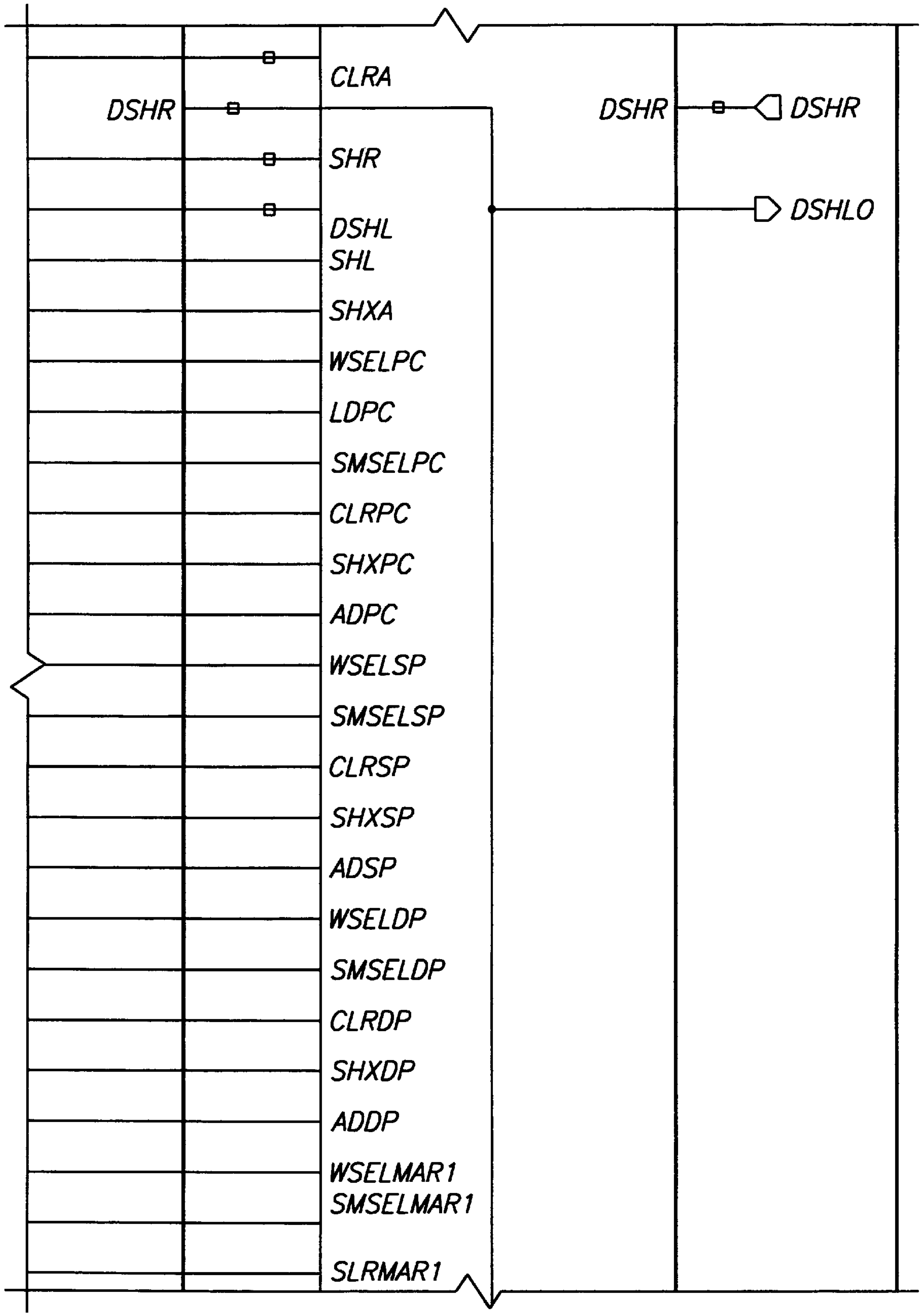
Fig 1.0901BE

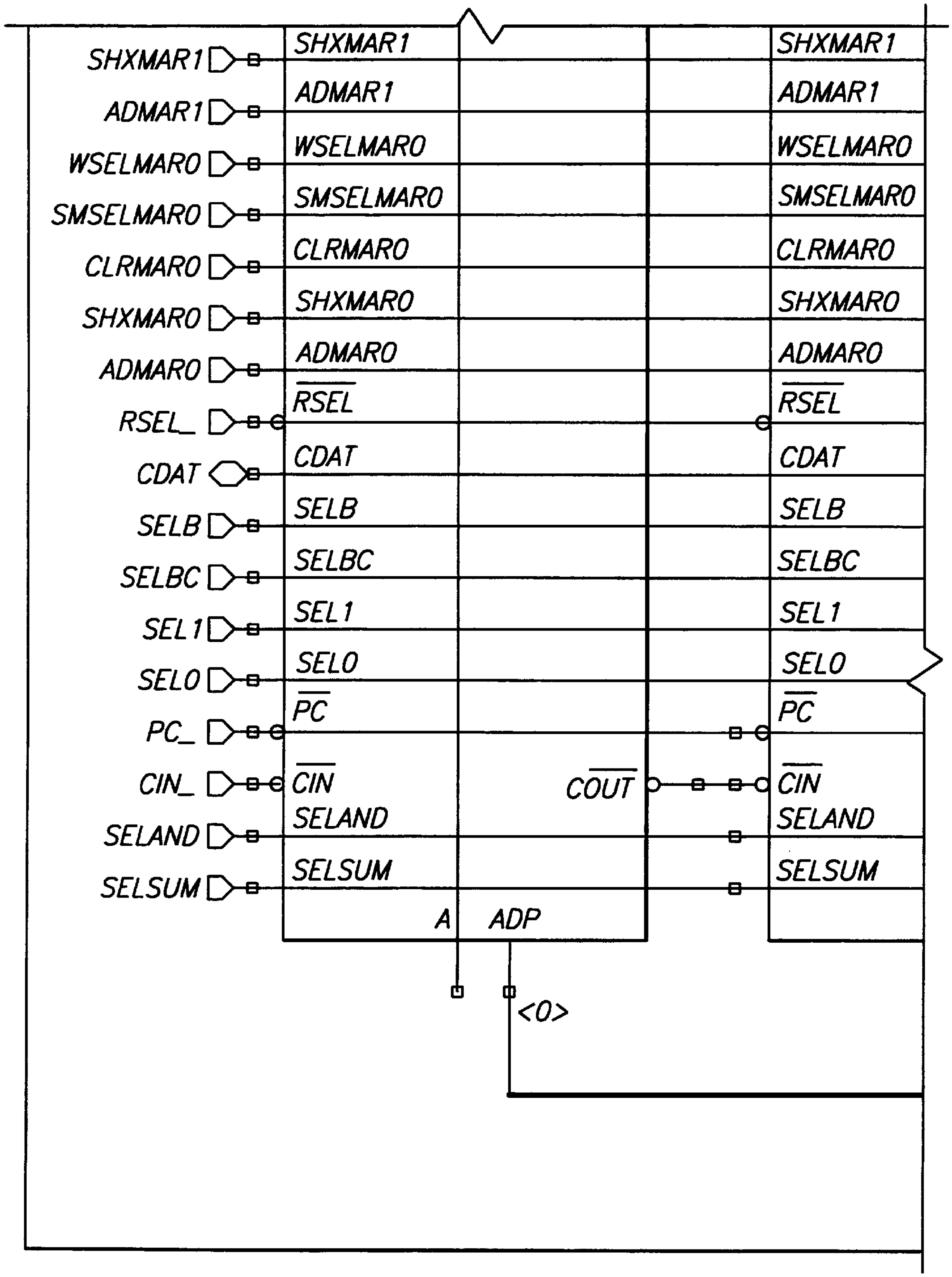
FIG 7.0901CA

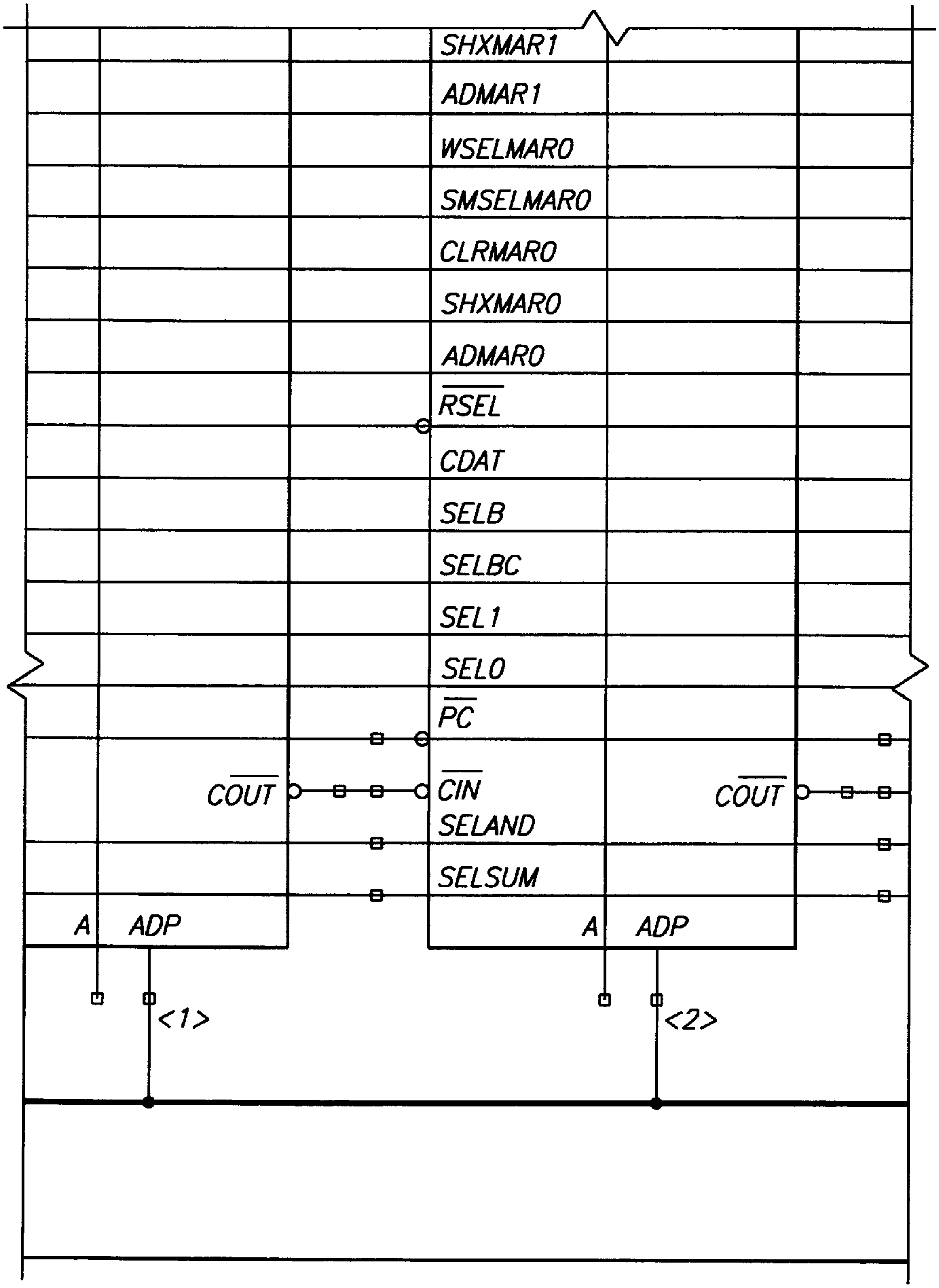
Fig 7.0901CB

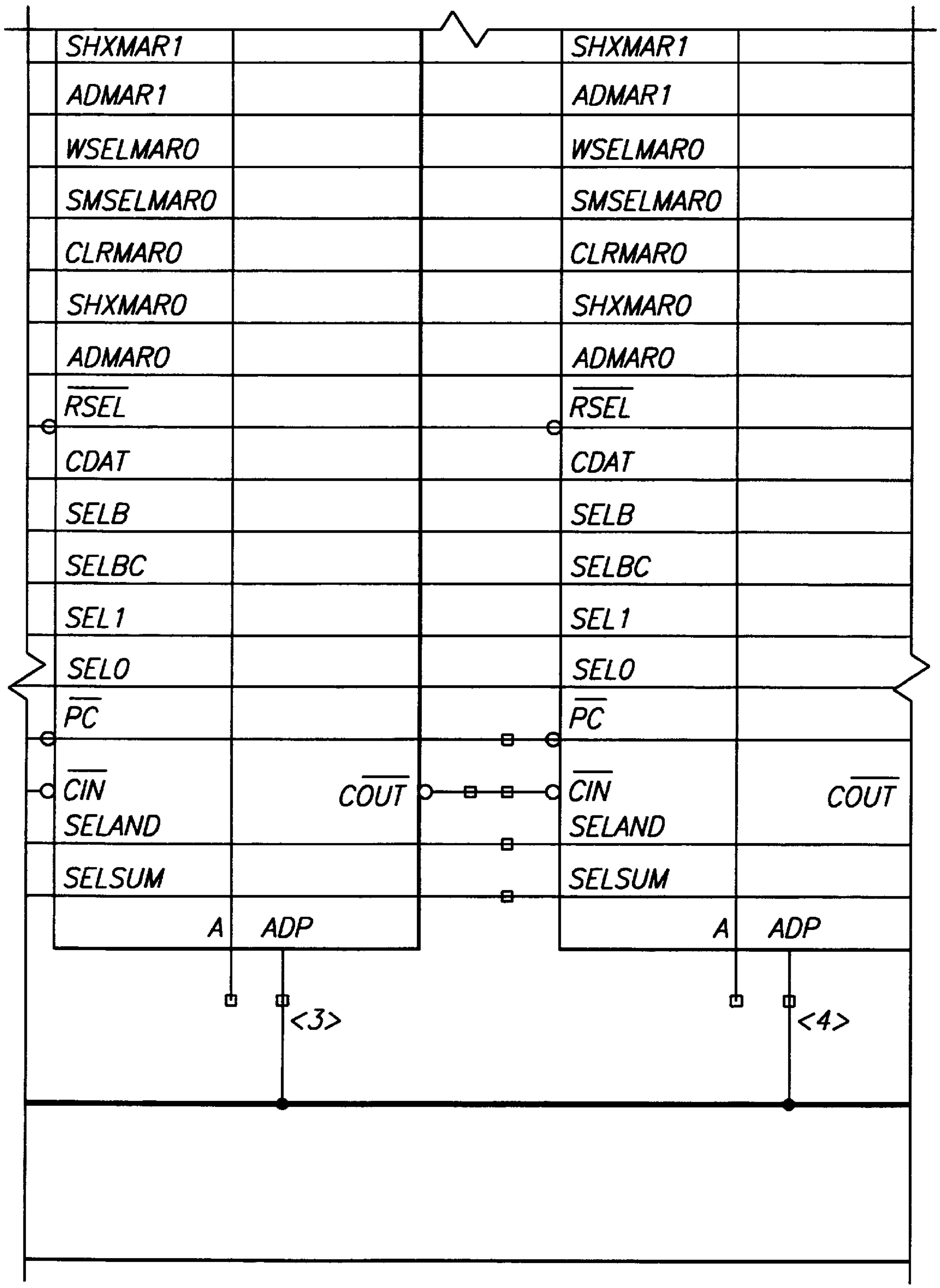
Fig 7.0901CC

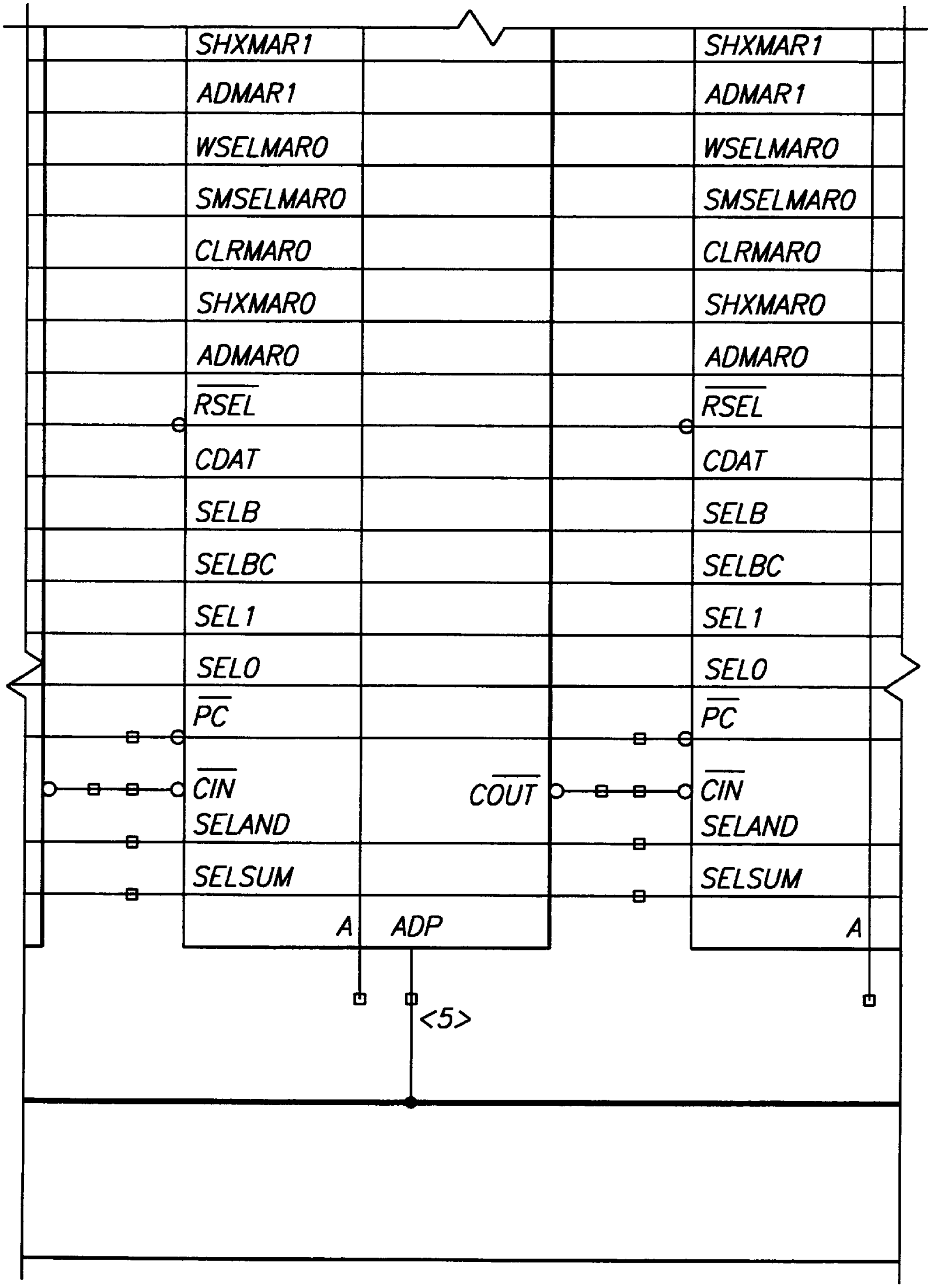
Fig 7.0901CD

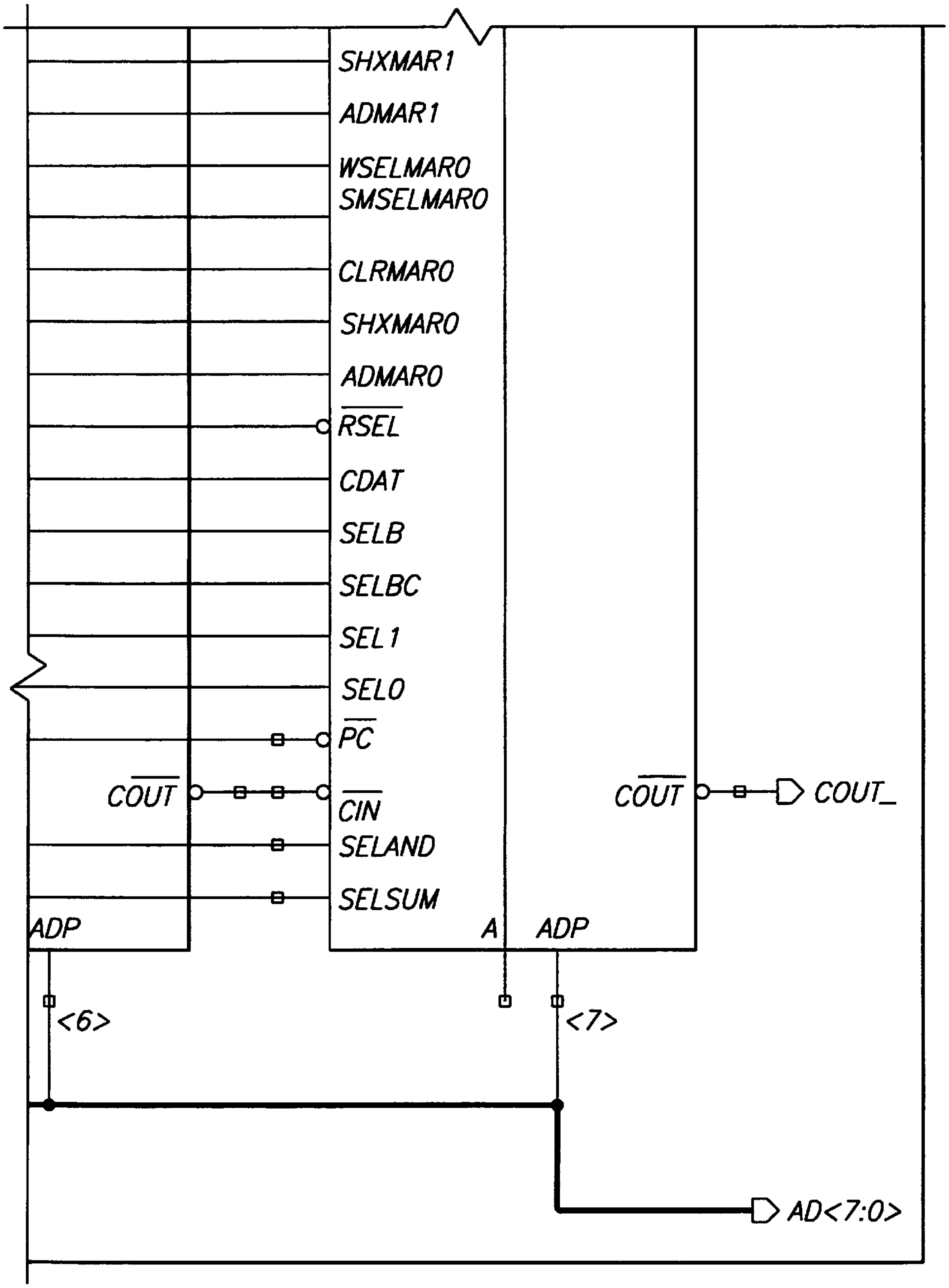
FIG 7.0901CE

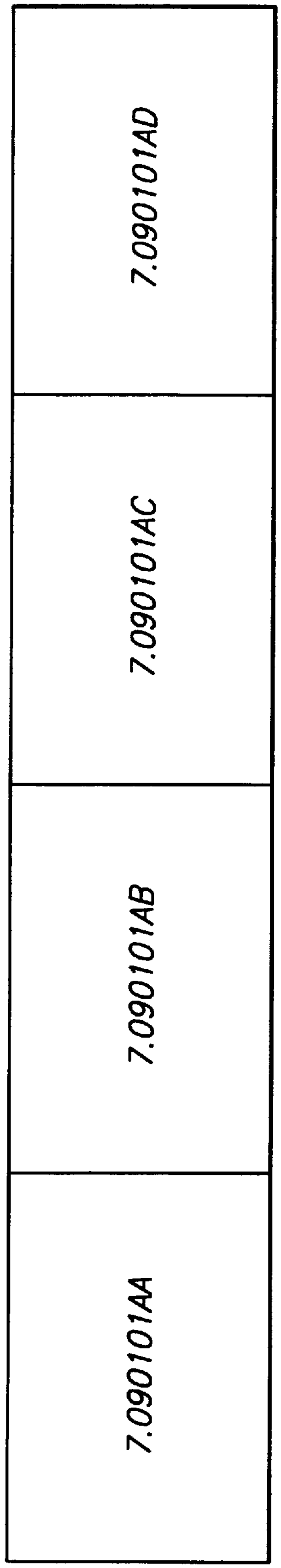
Fig. 7.090101

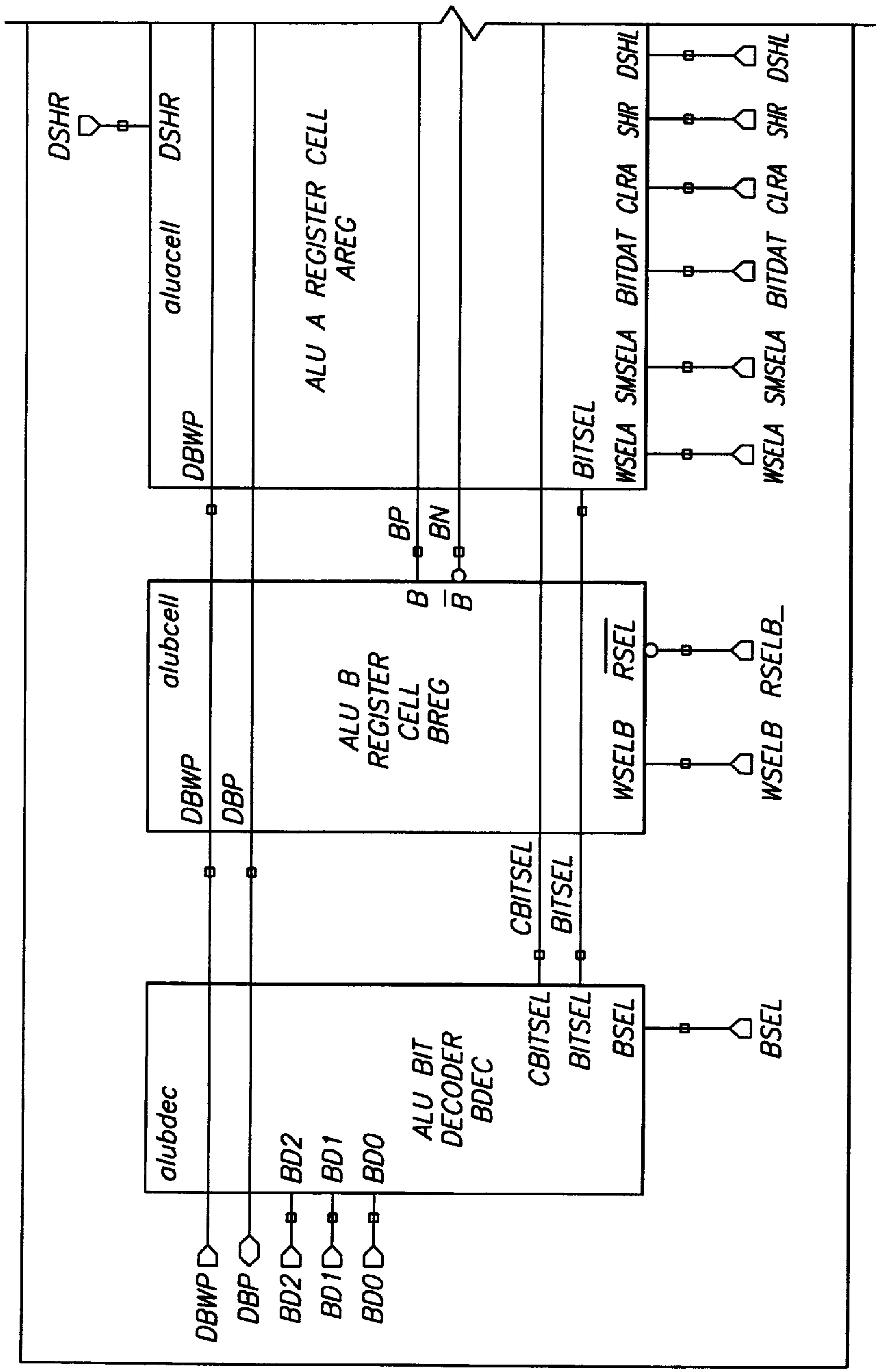
DSHR
aluacell
DSHR
ALU A REGISTER CELL
AREG
DBWP
BITSEL
WSELA SMSELA BITDAT CLRA SHR DSHL
WSELA SMSELA BITDAT CLRA SHR DSHL
BP
BN
alubcell
B
B
ALU B
REGISTER
CELL
BREG
DBWP
DBP
WSELB RSEL
WSELB RSELB_
CBITSEL
BITSEL
alubdec
ALU BIT
DECODER
BDEC
BD2
BD1
BD0
CBITSEL
BITSEL
BSEL
BSEL
DBWP
DBP
BD2
BD1
BD0

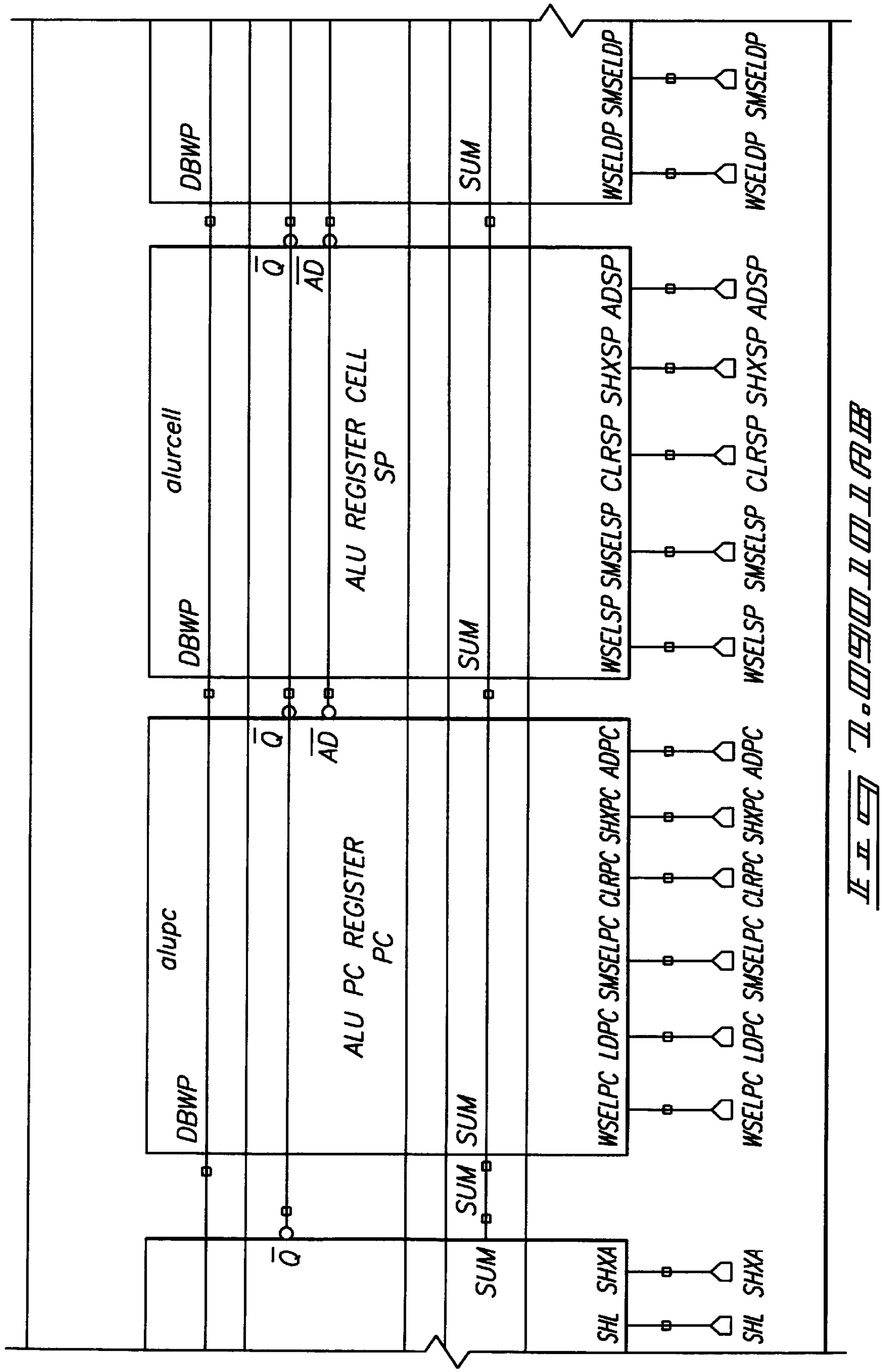
FIG. 7.0901AB

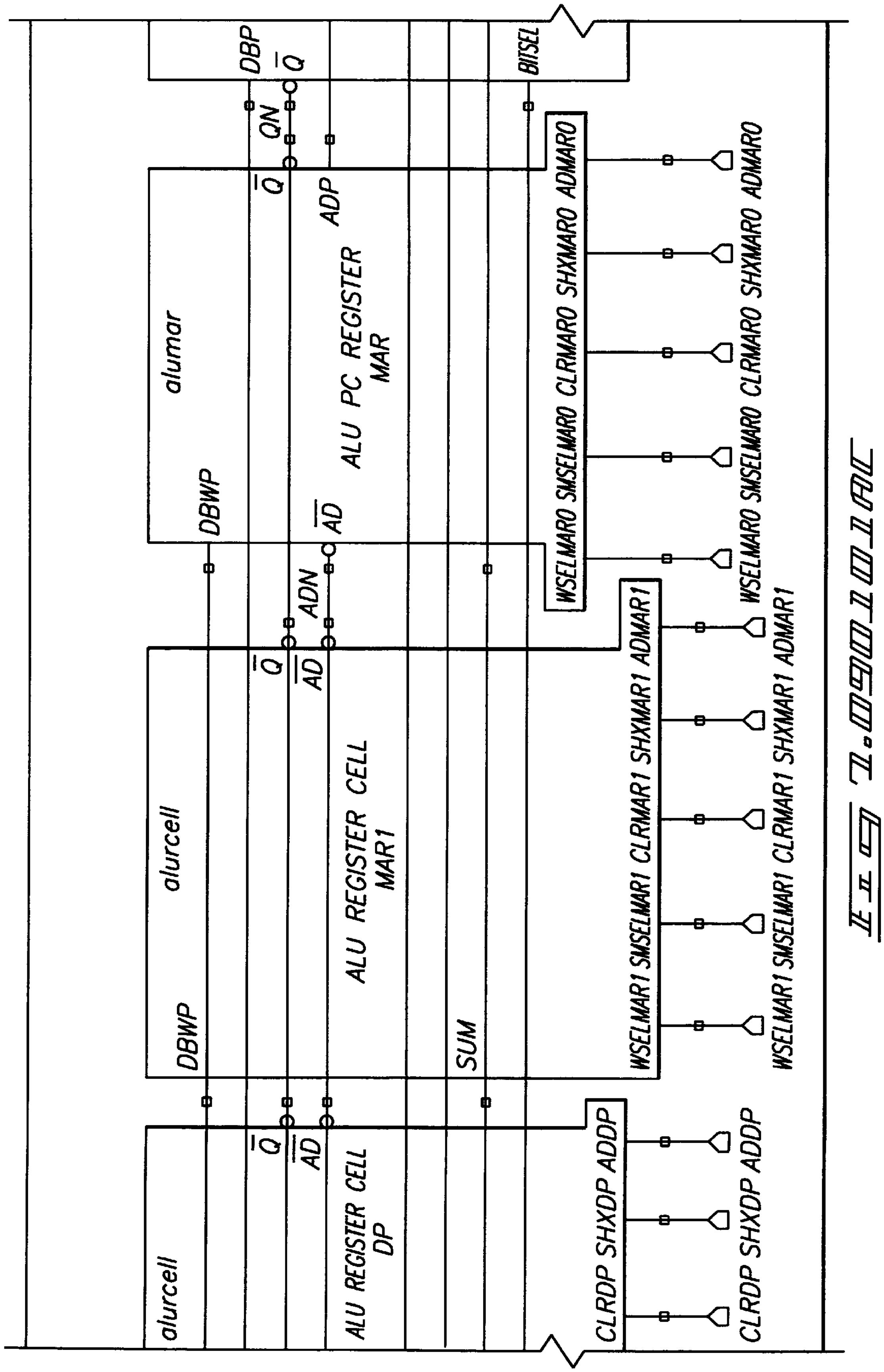
FIG. 1.090101AC

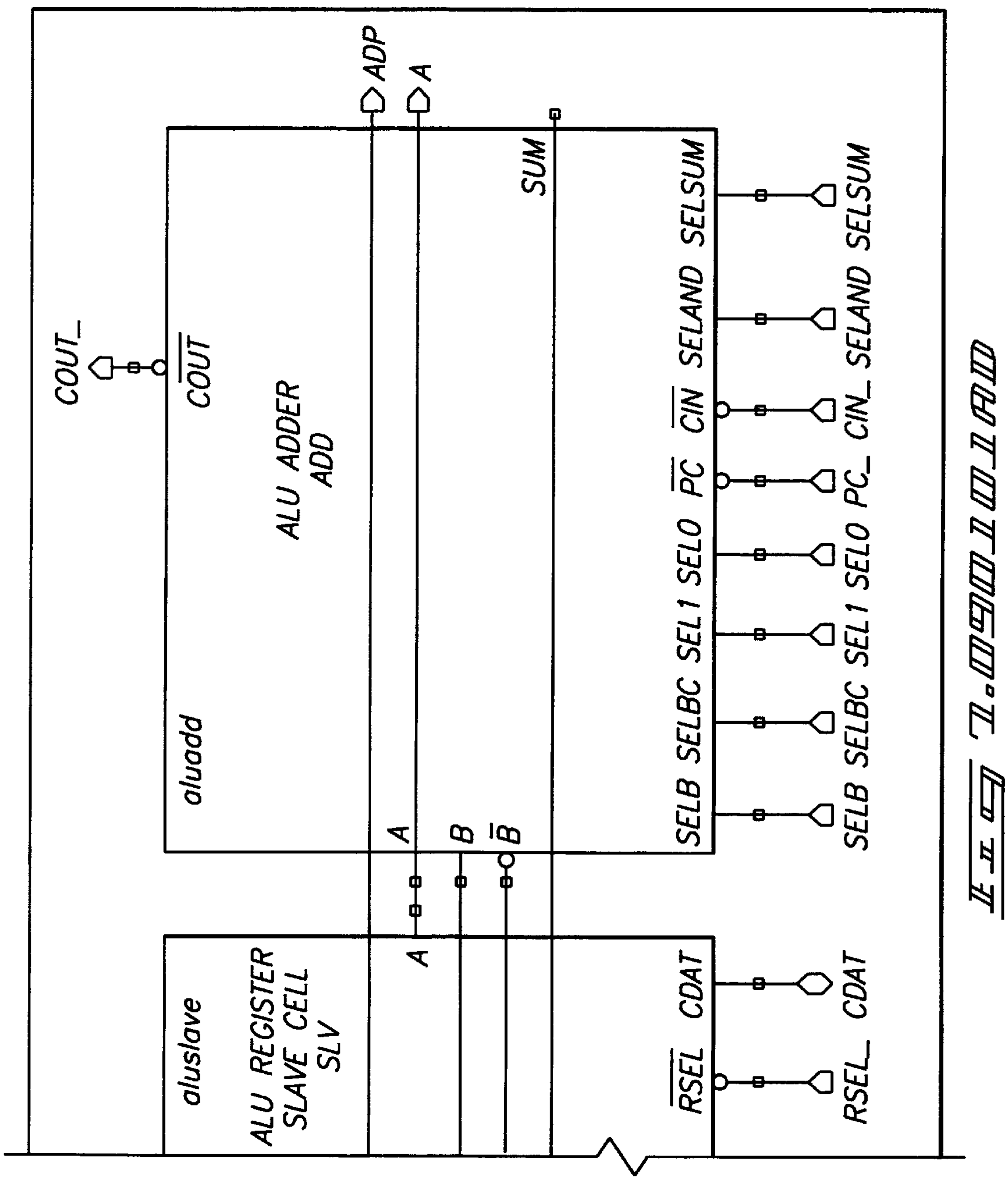
Fig. 7.090101AD

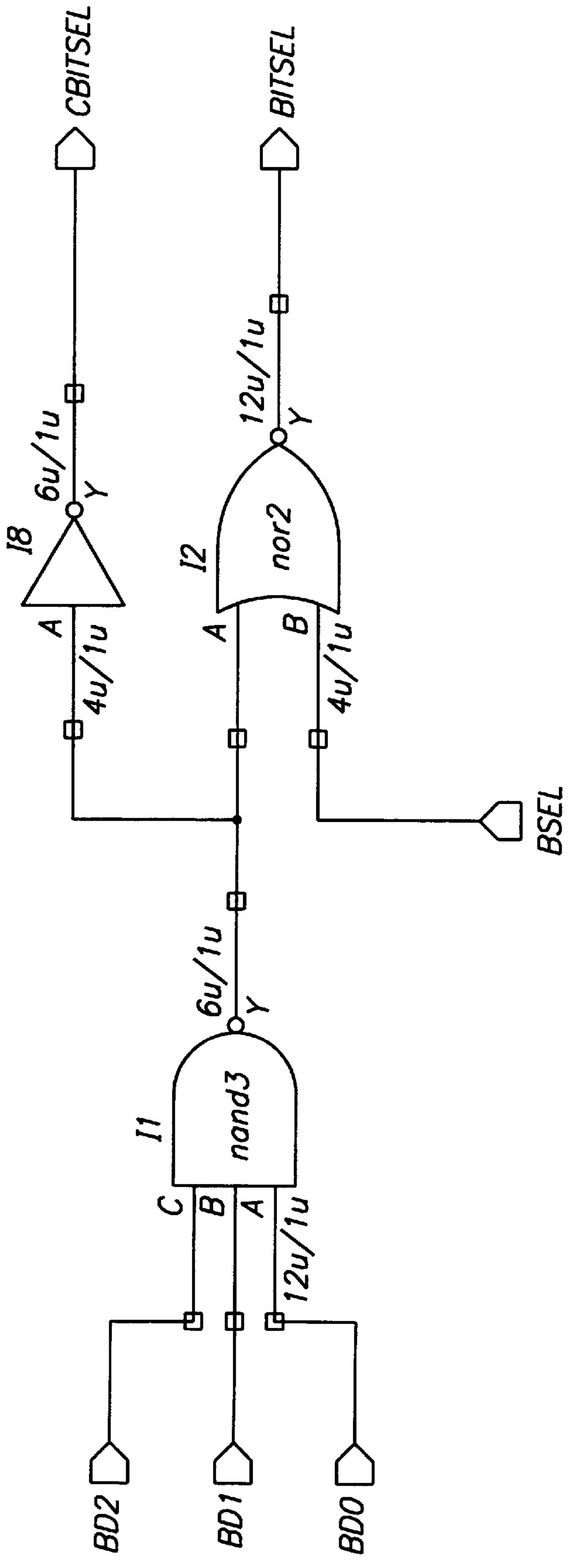
Fig. 1.09010101

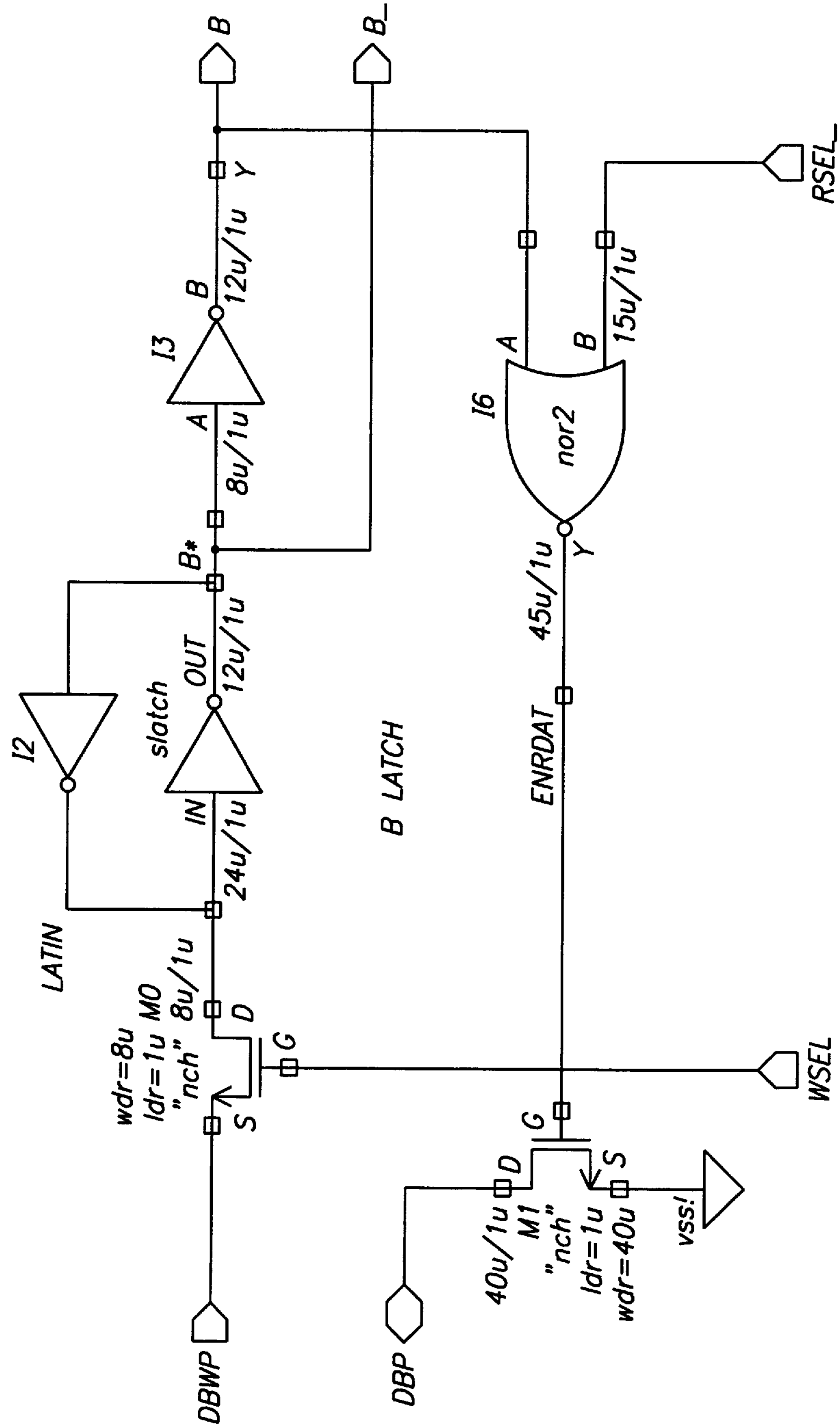
Fig. 7.09010102

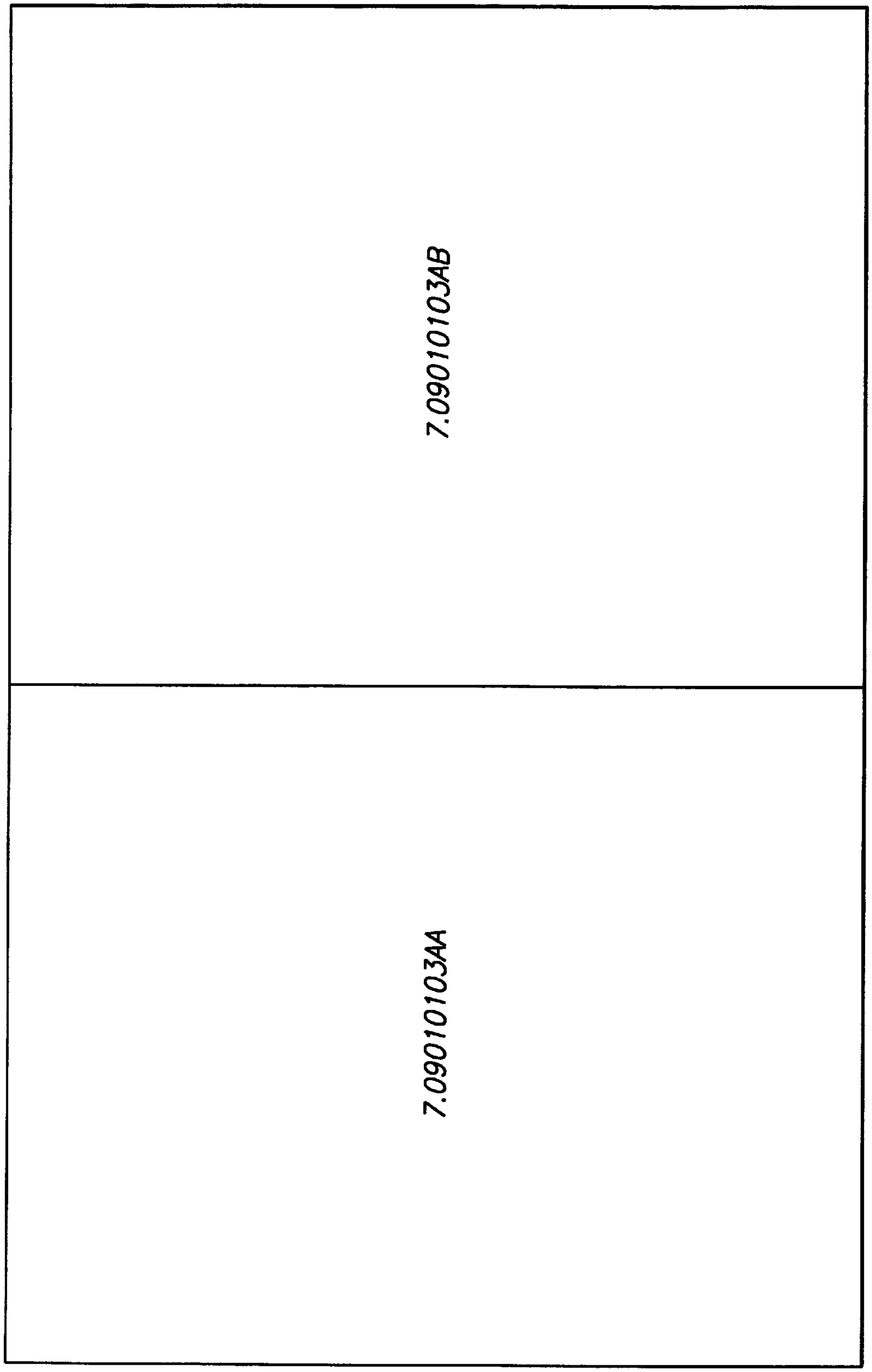
FIG. 7.09010103

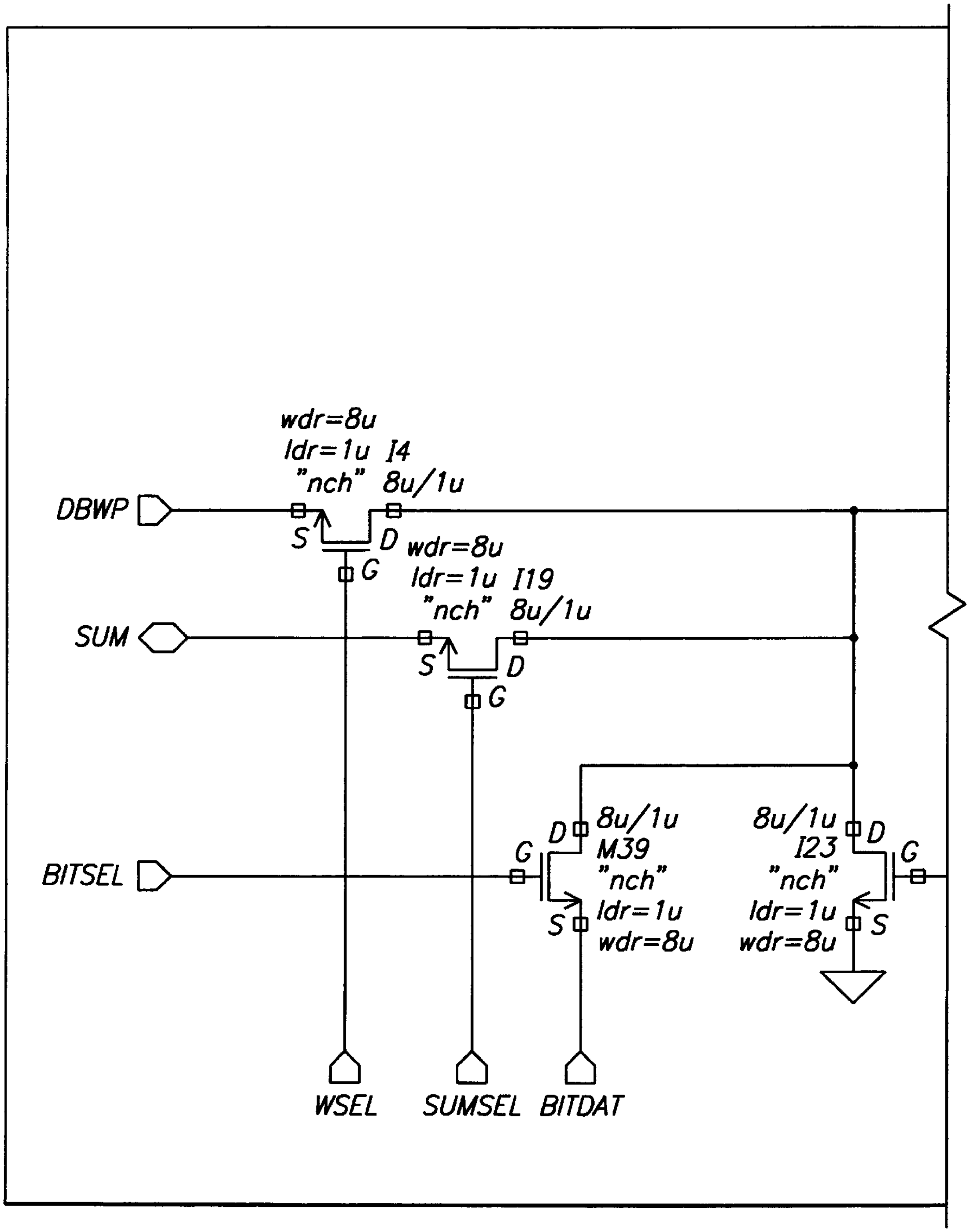
Fig 1.09010103AA

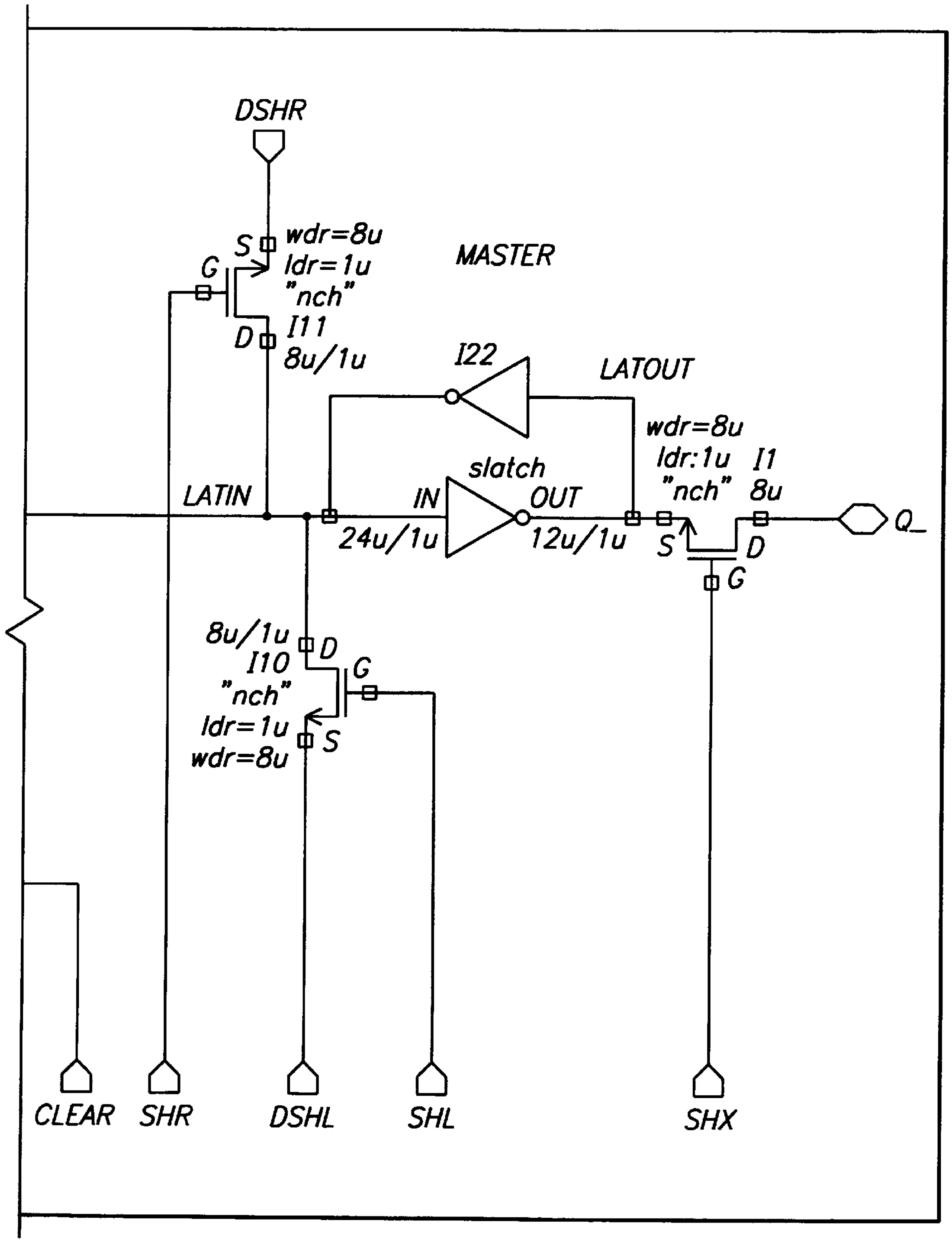
Fig 7.0901010103AB

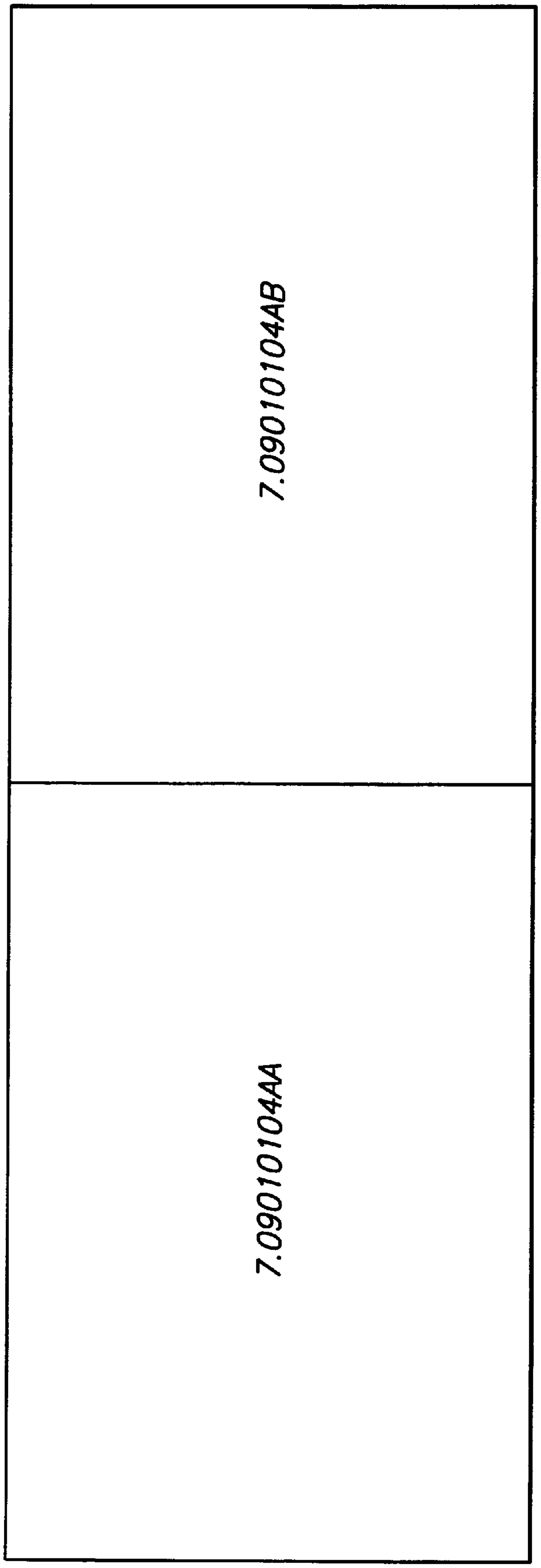
FIG. 7.09010104

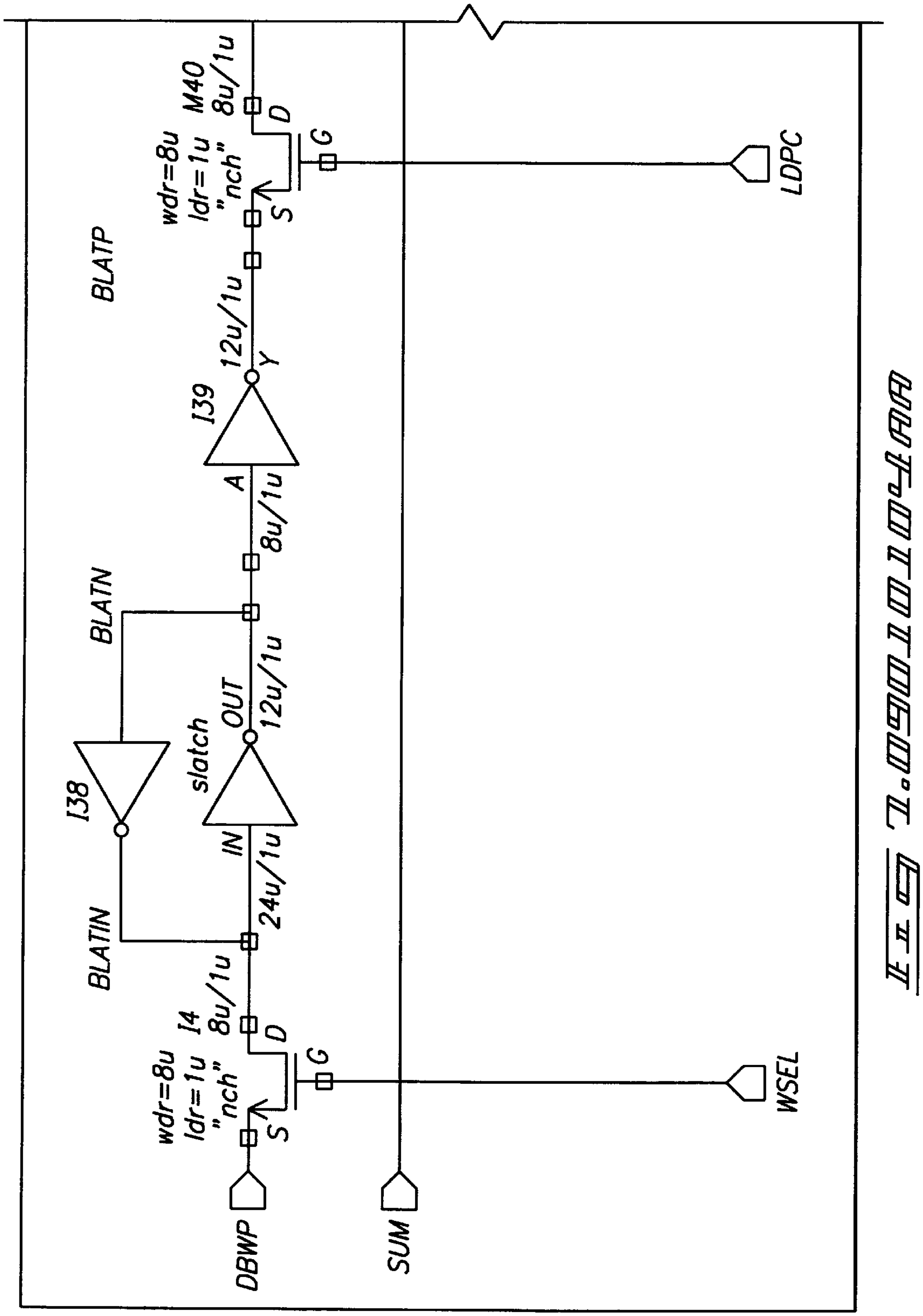
FIG. 7.090.10.AA

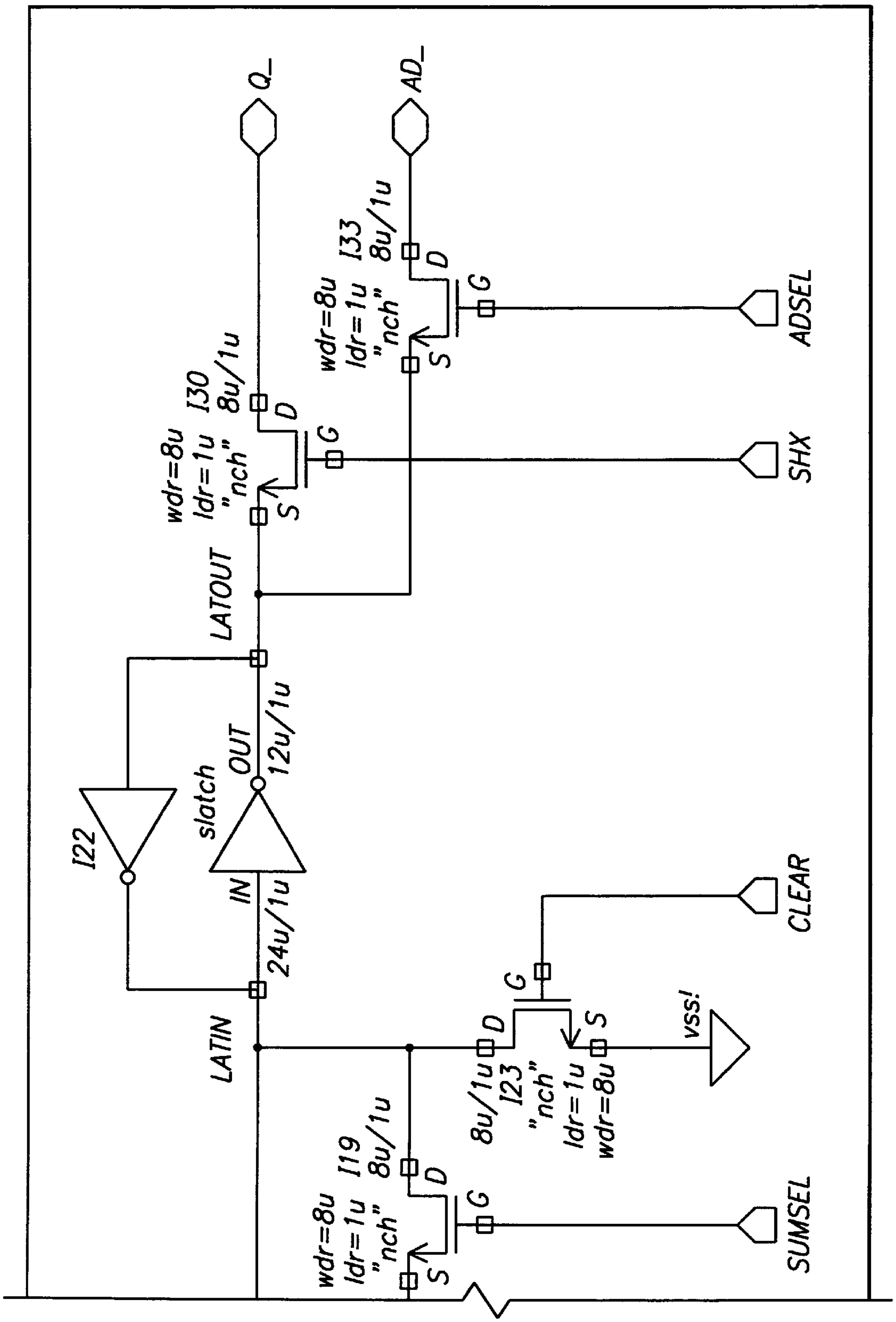
FIG. 7.06010104AB

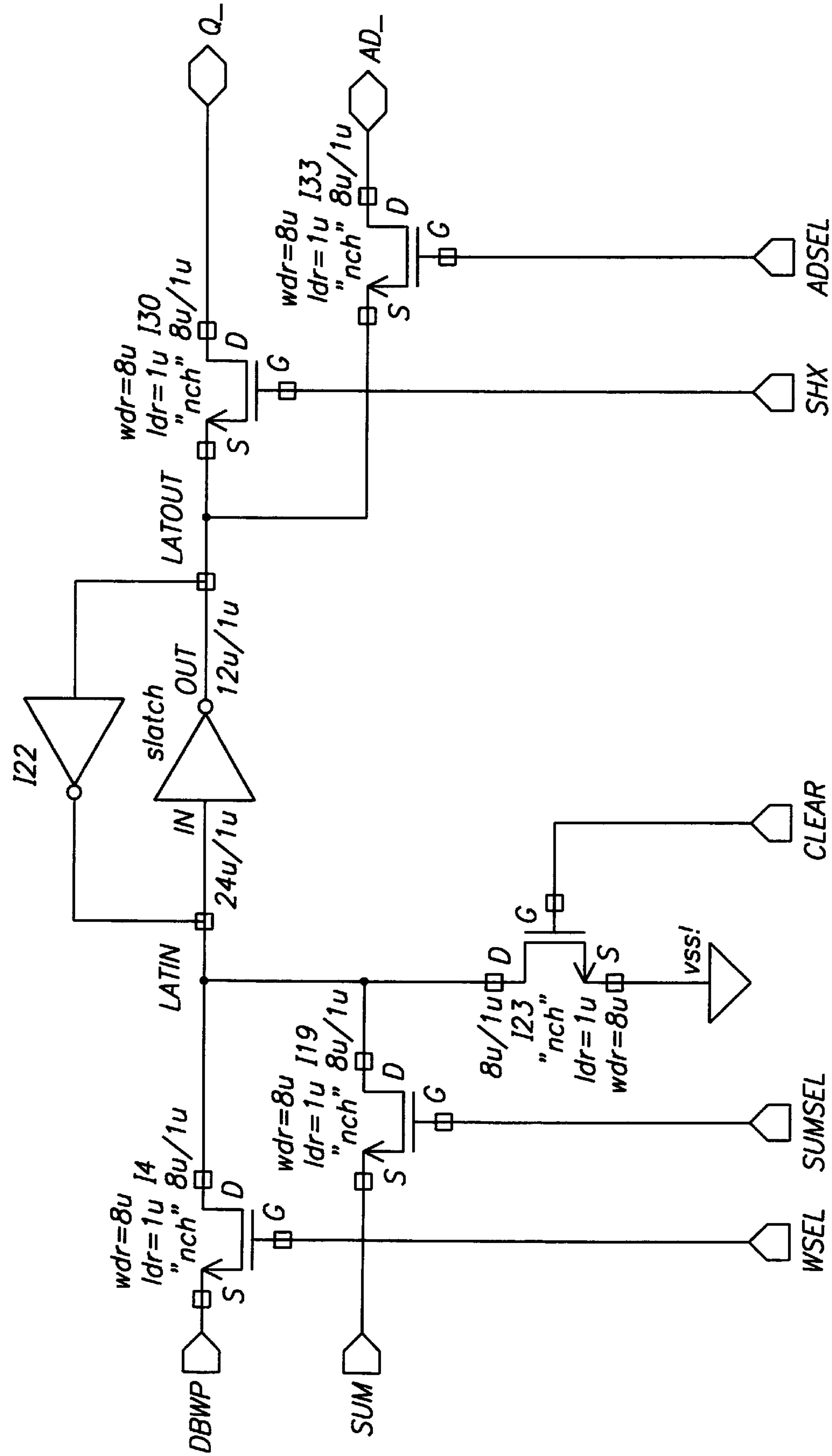
FIG. 7.0910105

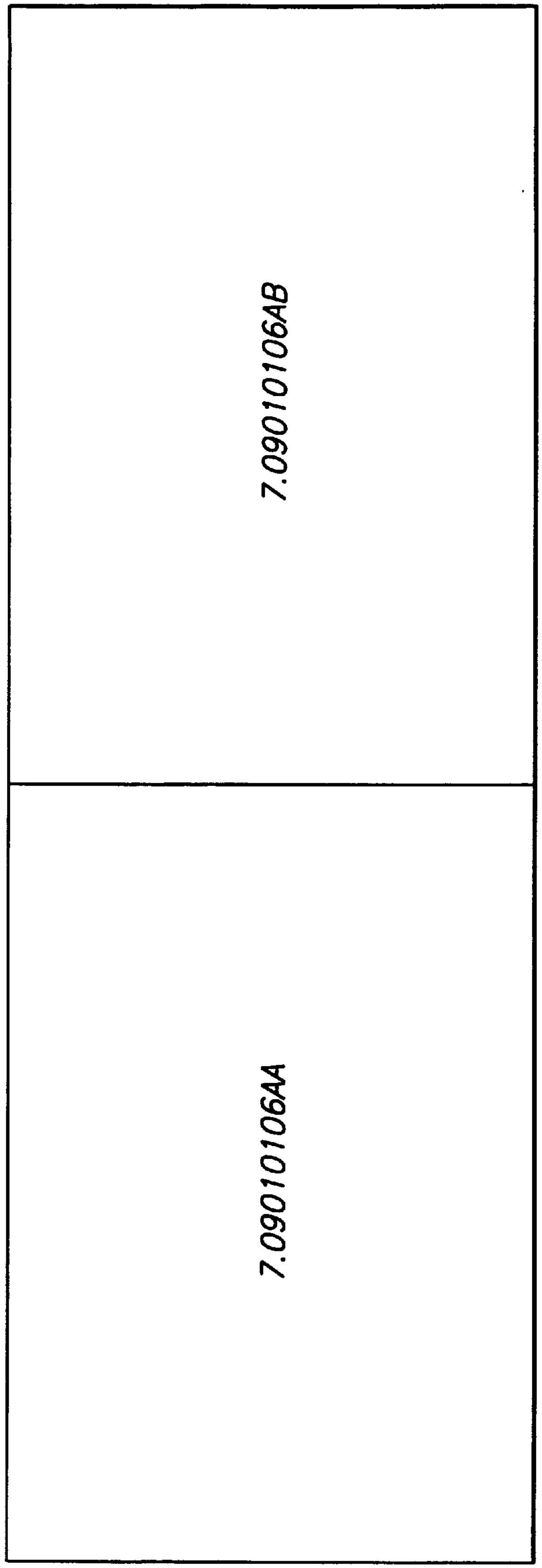
FIG. 7.09010106

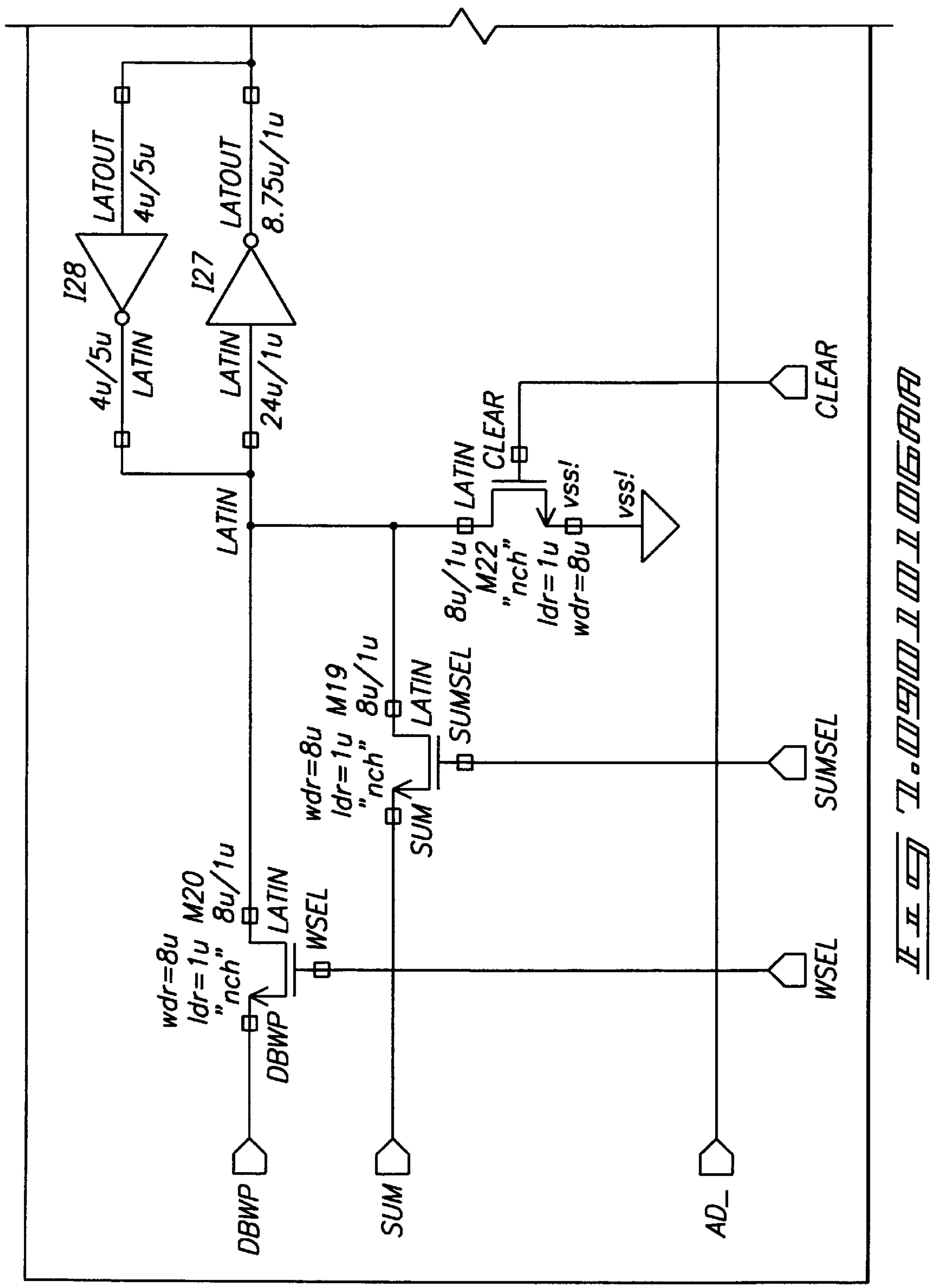
FIG. 7.09010106AA

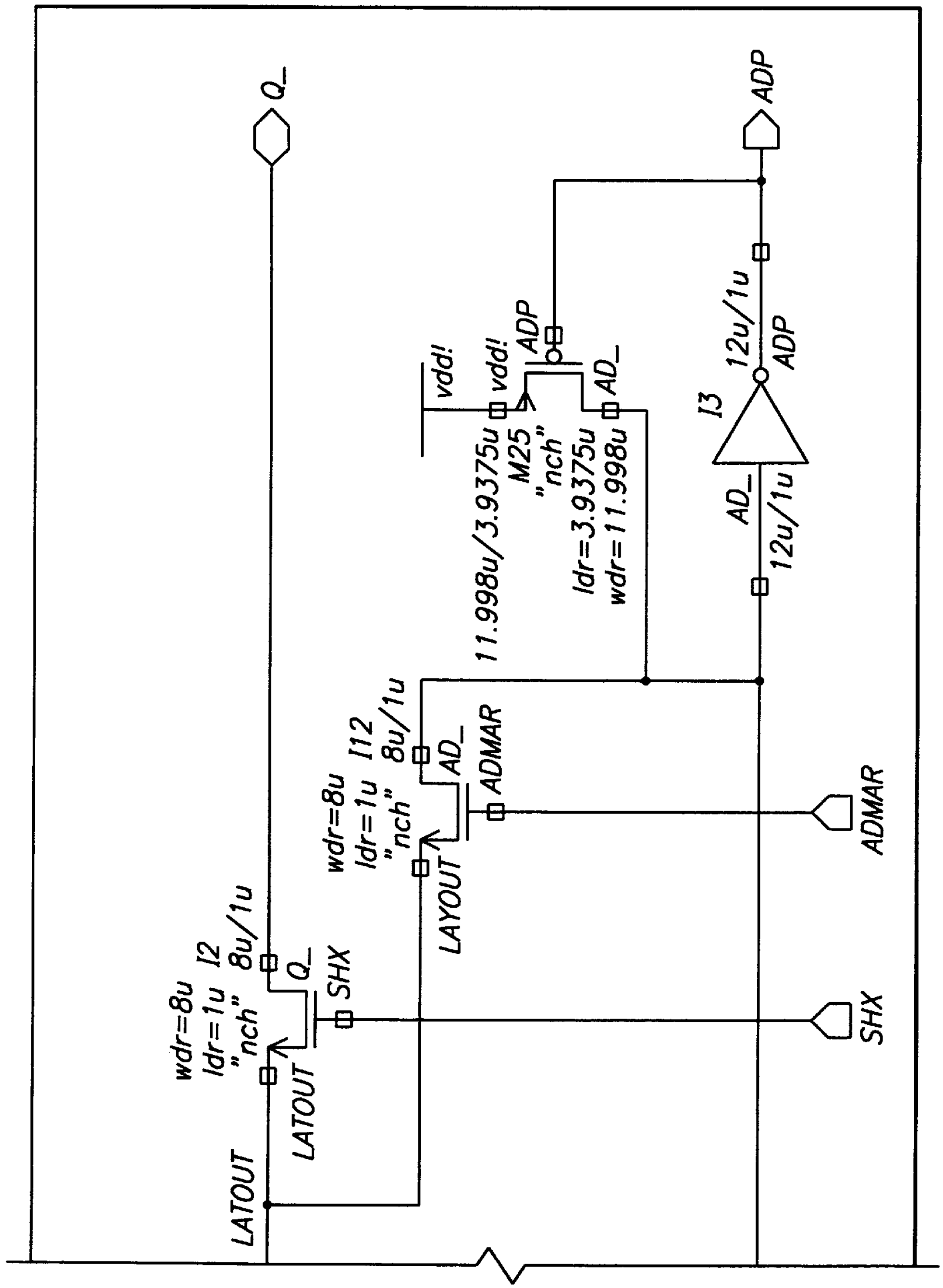
Q_
ADP
vdd!
vdd!
ADP
AD_
M25
"nch"
11.998u/3.9375u
ldr=3.9375u
wdr=11.998u
I3
12u/1u
ADP
AD_
12u/1u
wdr=8u
ldr=1u
"nch"
I12
8u/1u
AD_
ADMAR
LAYOUT
ADMAR
wdr=8u
ldr=1u
"nch"
I2
8u/1u
Q_
SHX
LATOUT
SHX
LATOUT

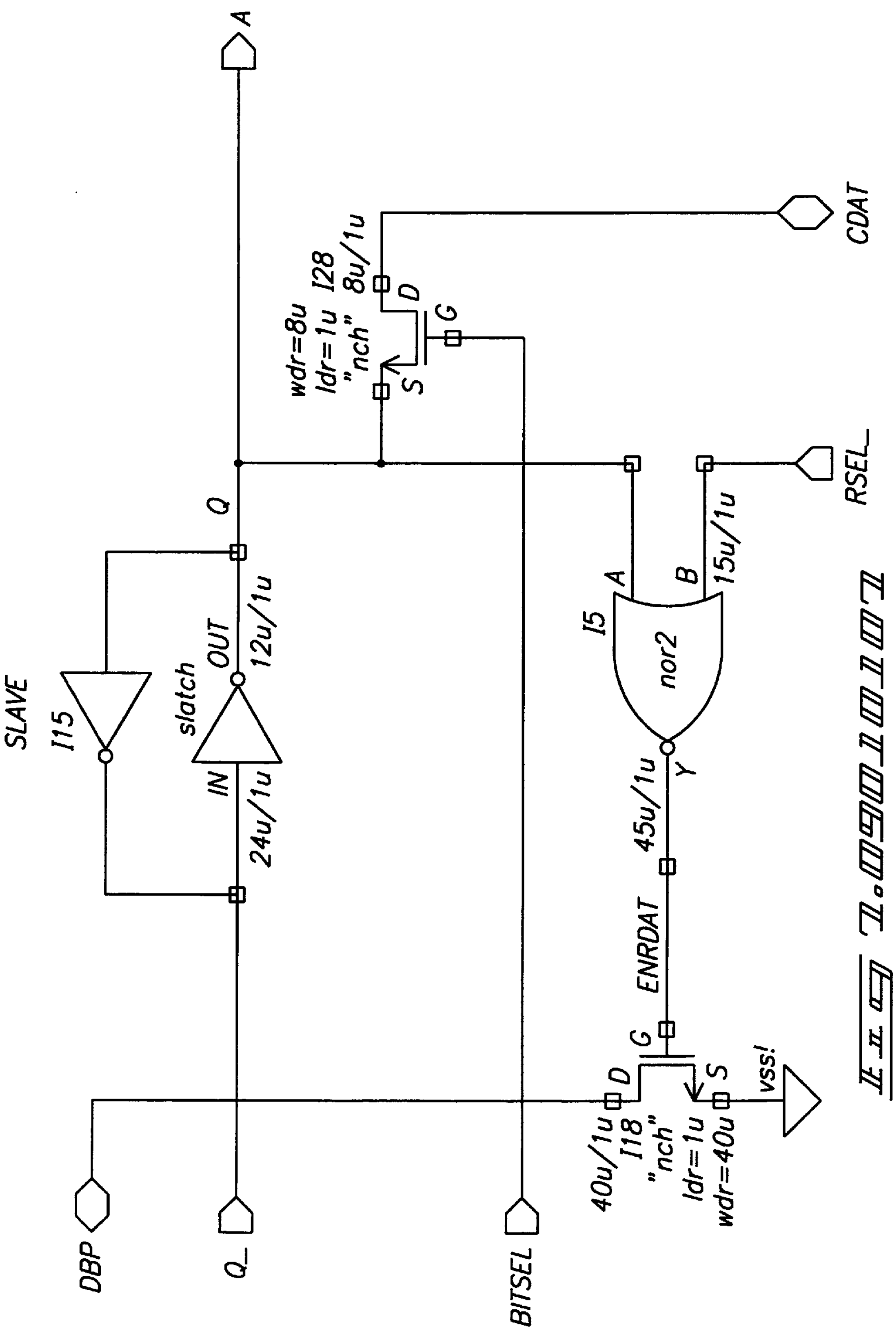
FIG_ 7.09010107

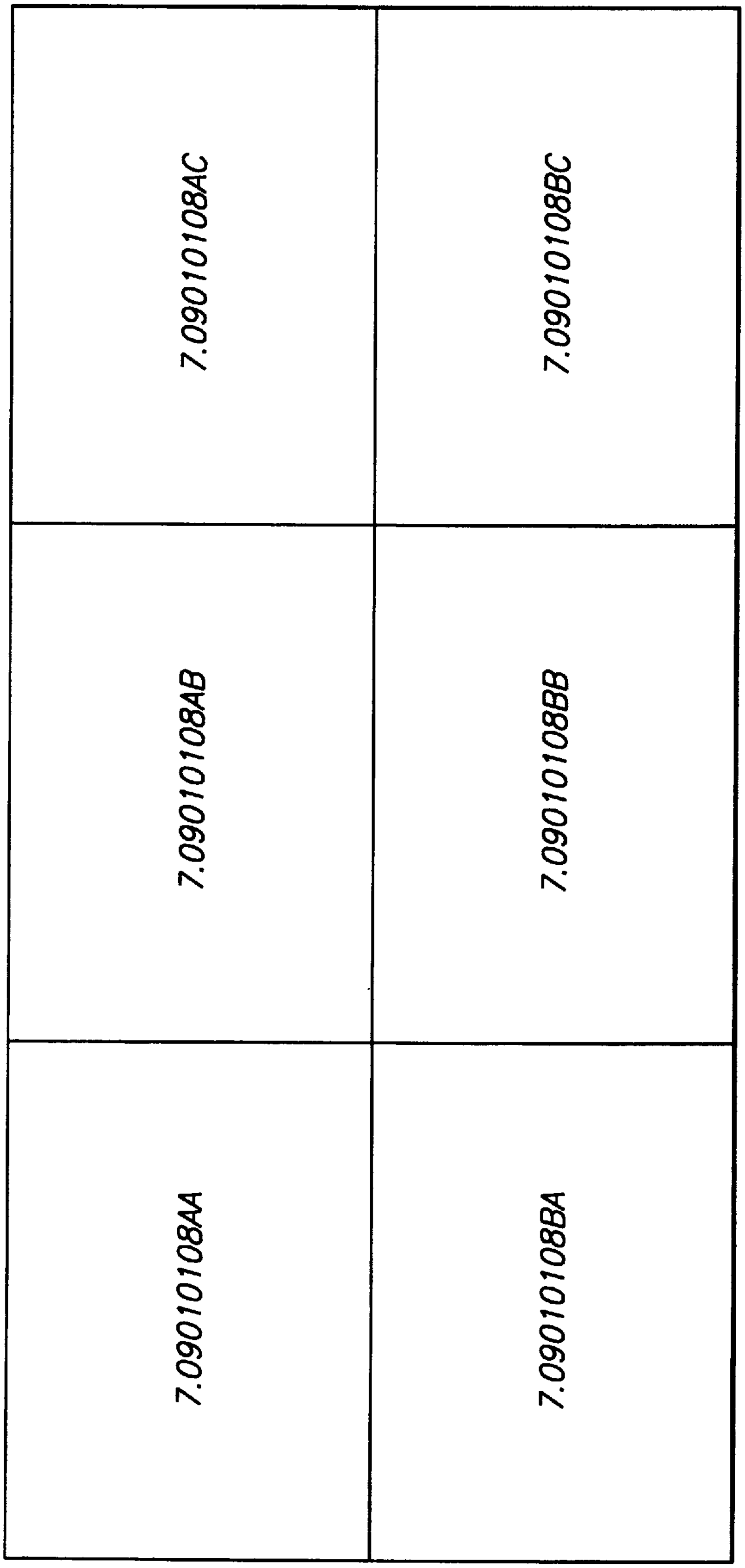
FIG. 7.09010108

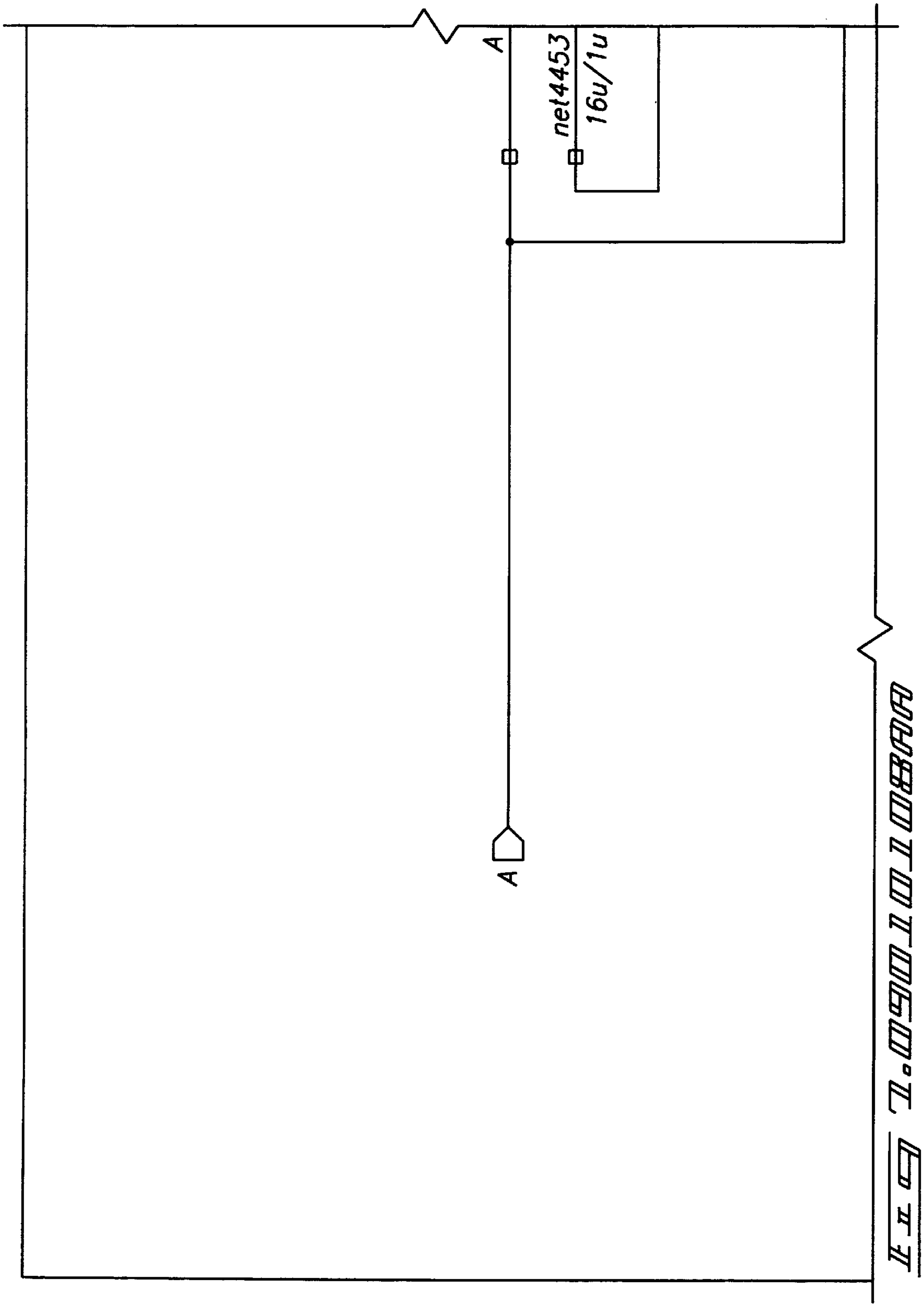
FIG. 7.006010108AA

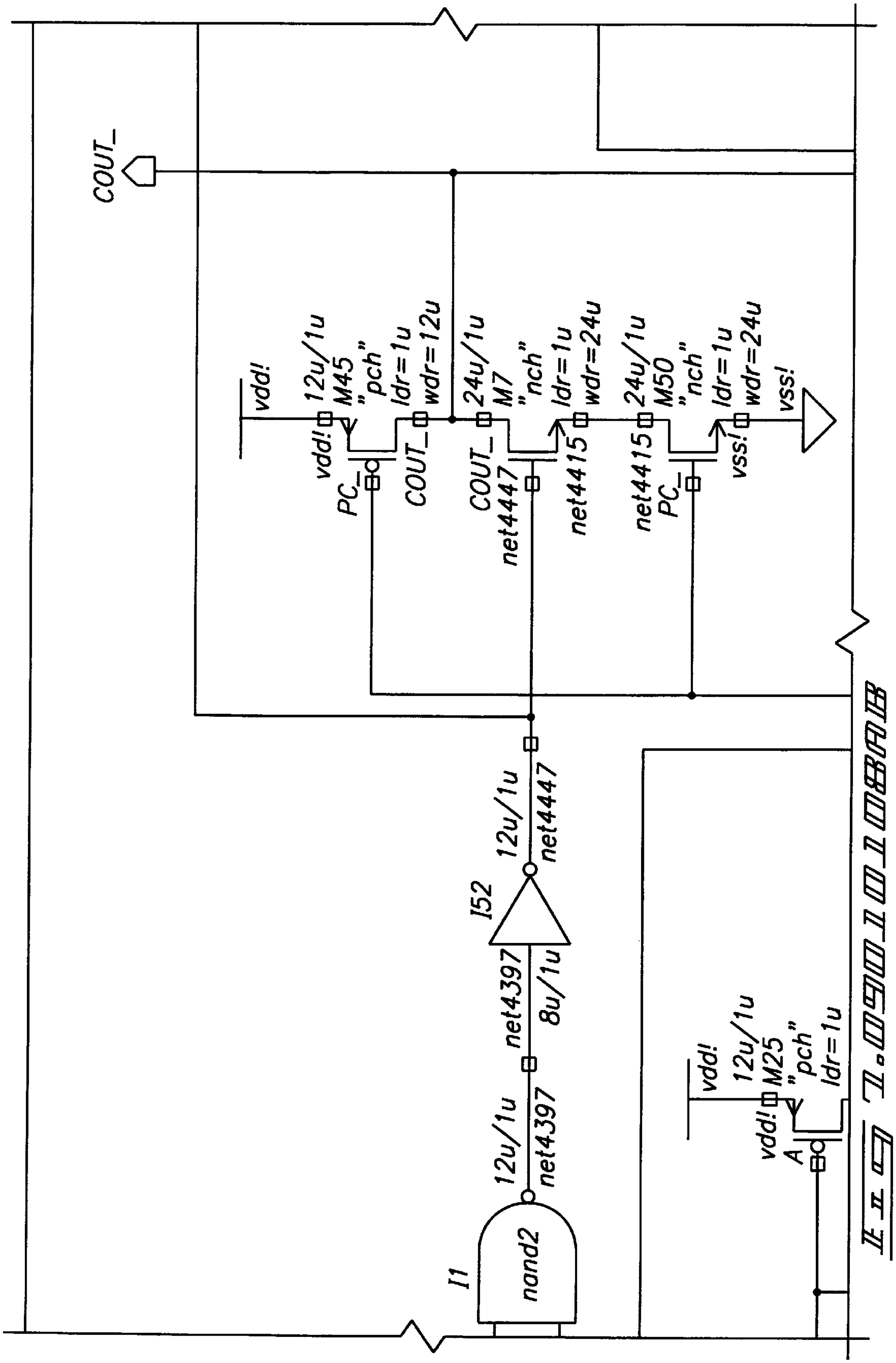
FIG. 7.09010108AB

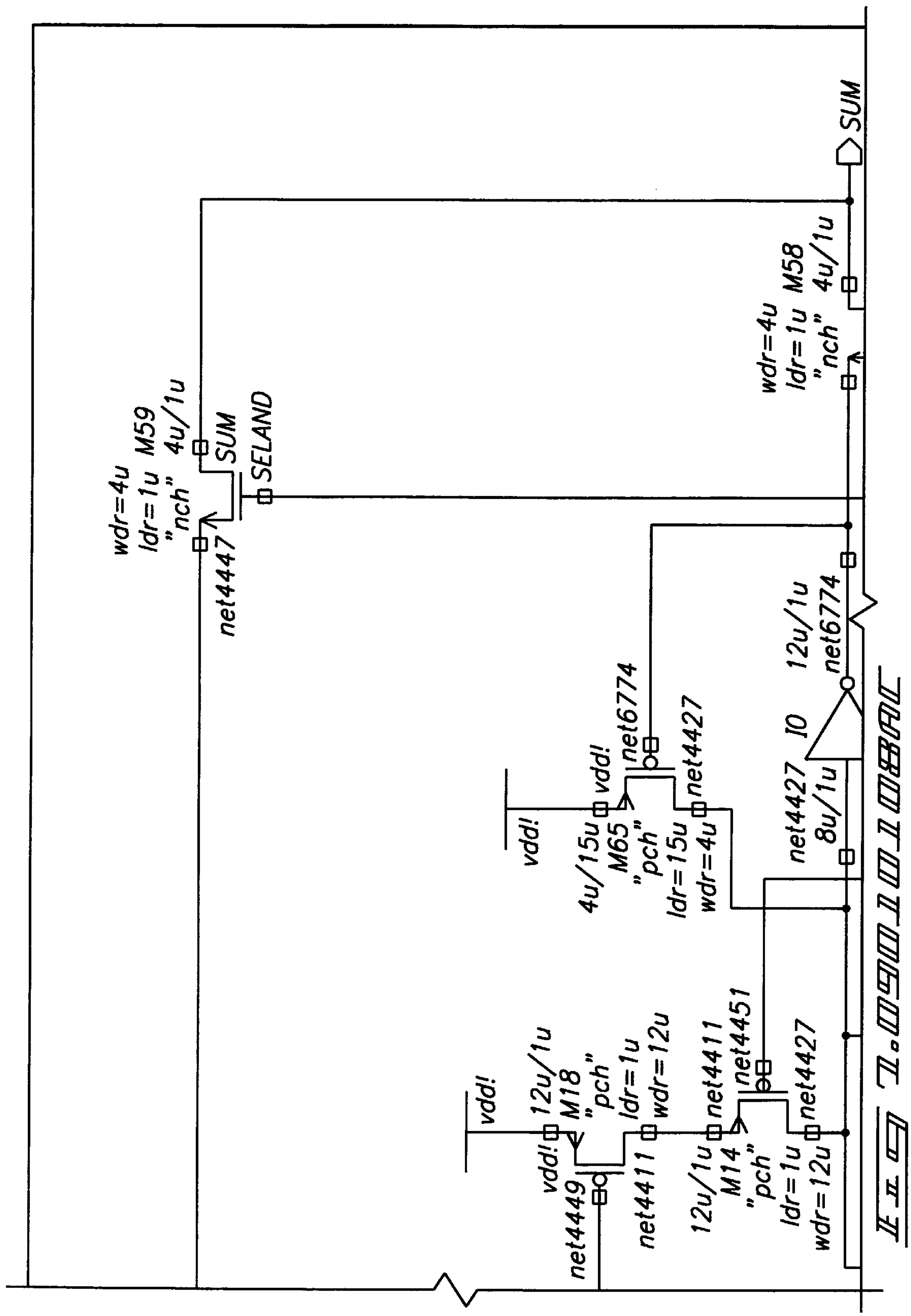
FIG. 7.0901010BAC

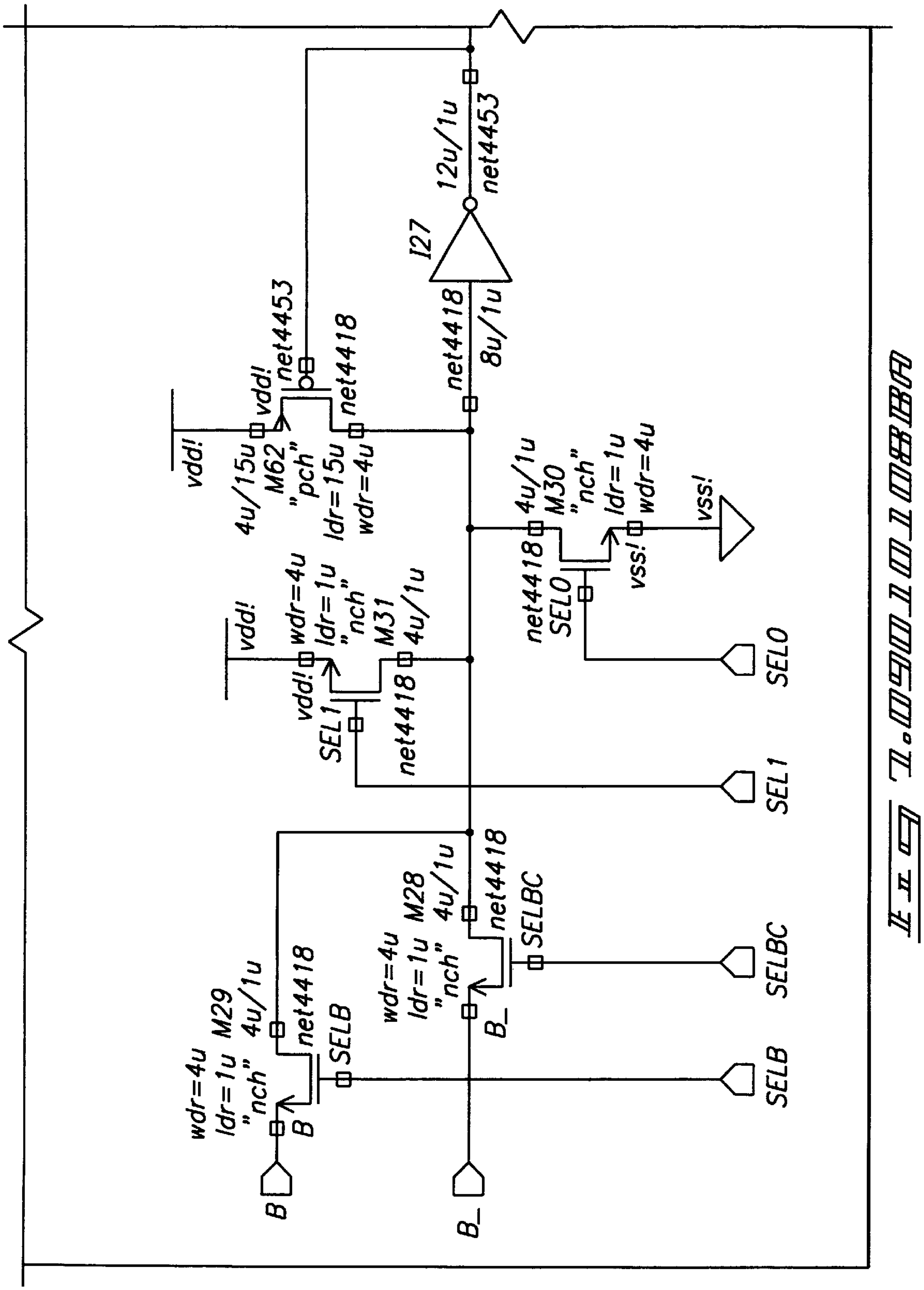
vdd!
4u/15u
M62
"pch"
ldr=15u
wdr=4u
net4453
net4418
I27
12u/1u
net4453
net4418
8u/1u
4u/1u
M30
"nch"
ldr=1u
wdr=4u
vss!
net4418
SEL0
vdd!
wdr=4u
ldr=1u
"nch"
M31
4u/1u
SEL1
net4418
SEL0
SEL1
SELBC
SELB
M28
4u/1u
wdr=4u
ldr=1u
"nch"
B_
M29
4u/1u
net4418
SELB
B
B_

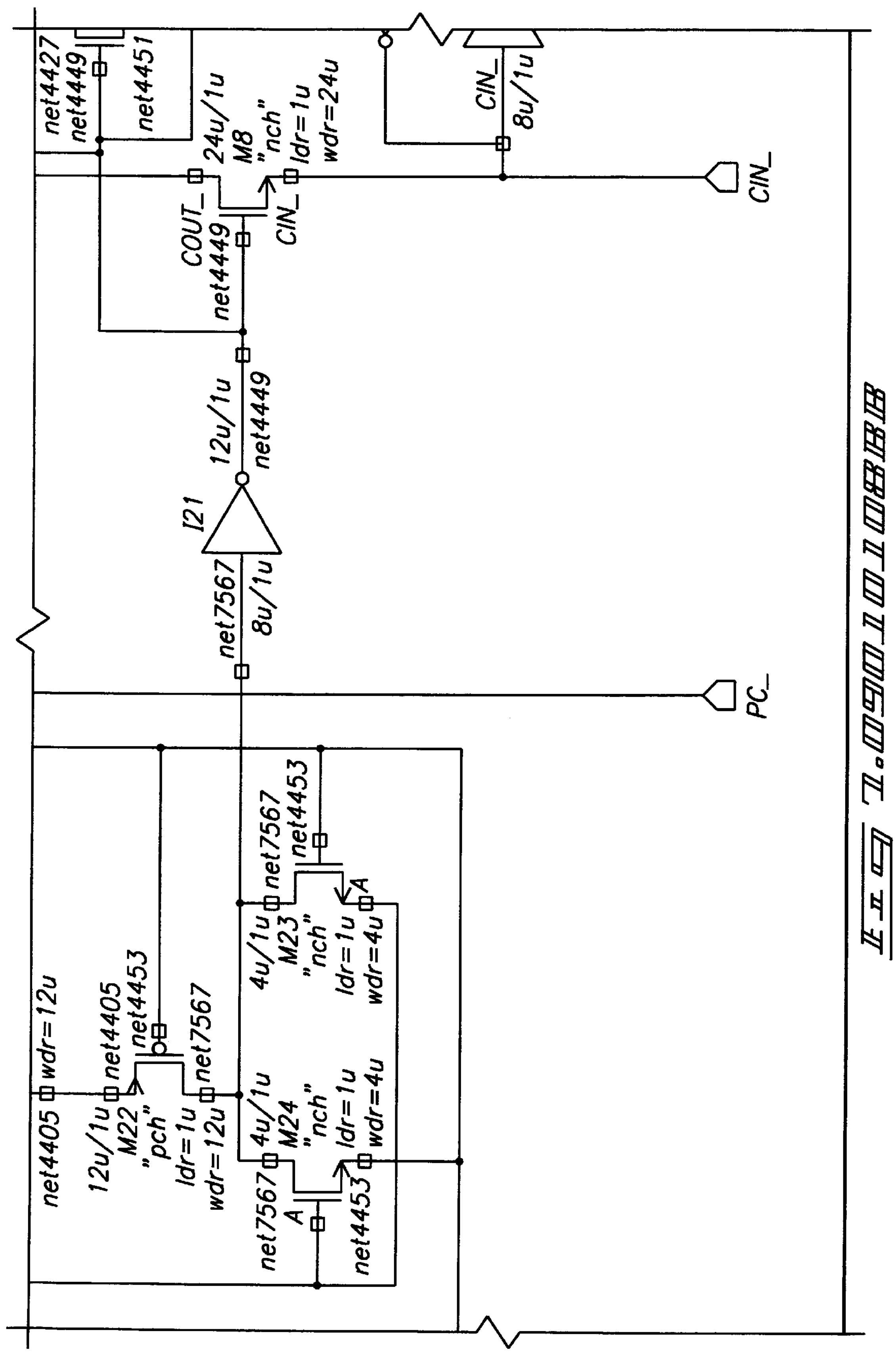
Fig. 7.090101088B

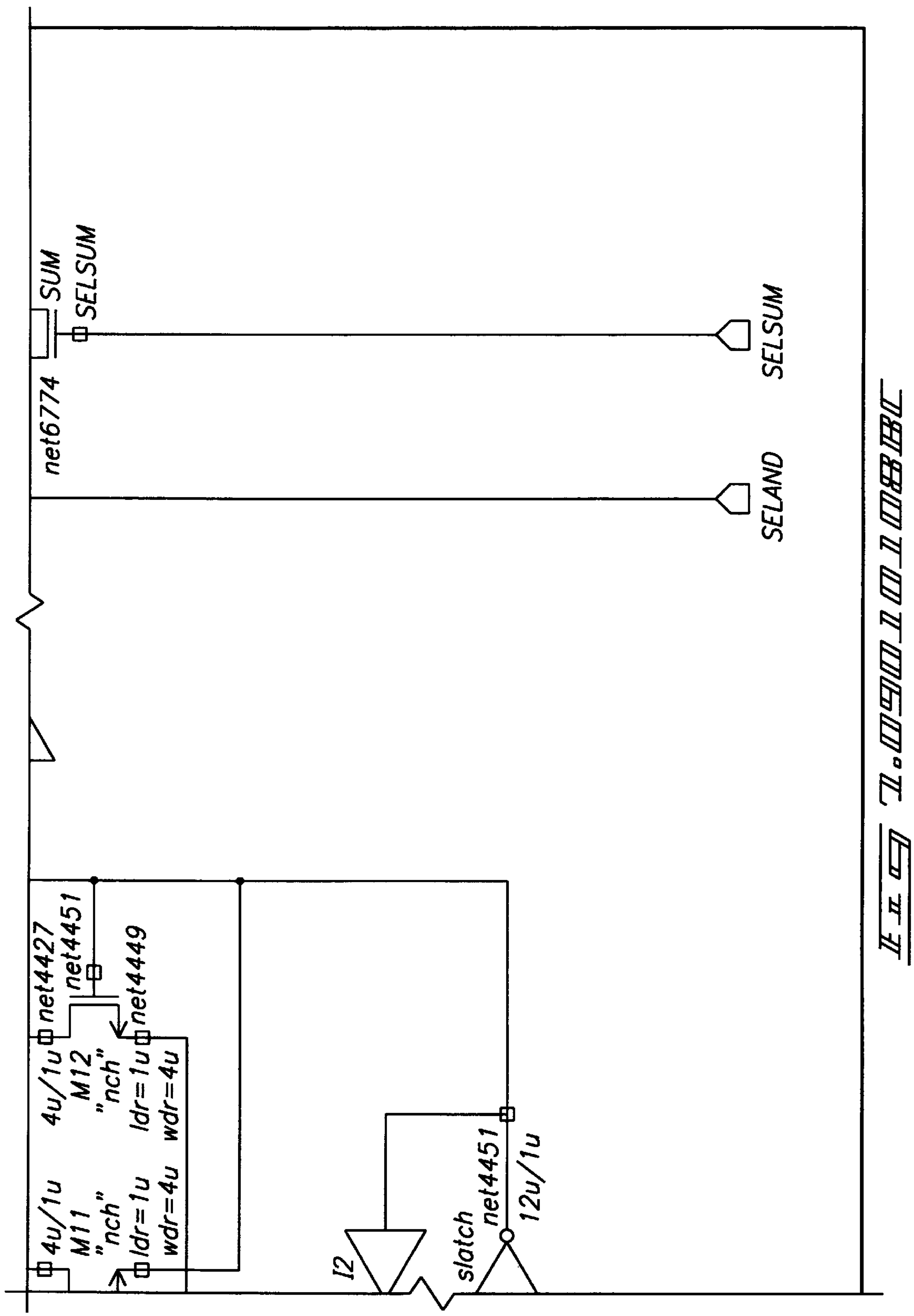
FIG. 7.090101088C

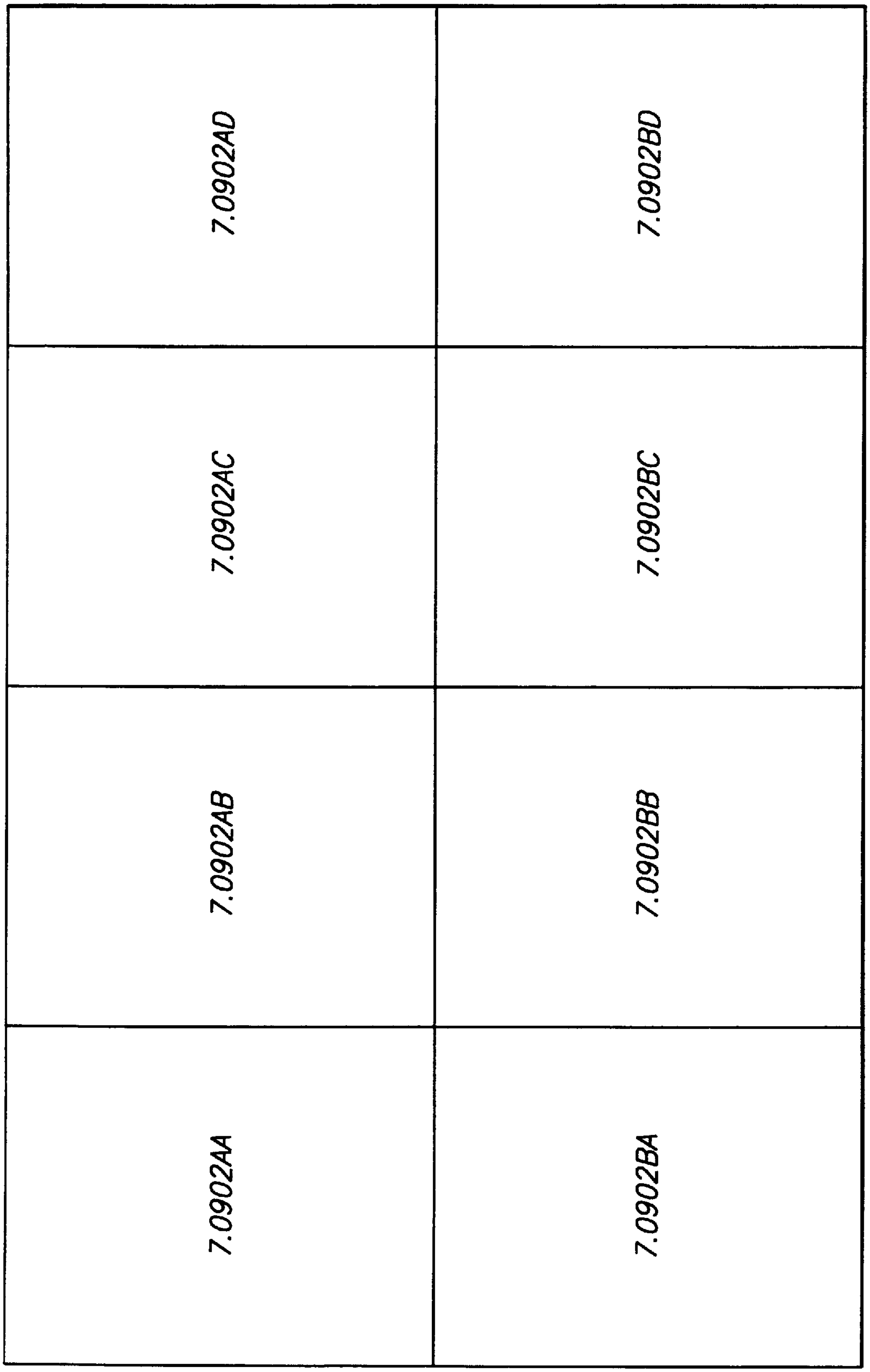
FIG. 7.0902

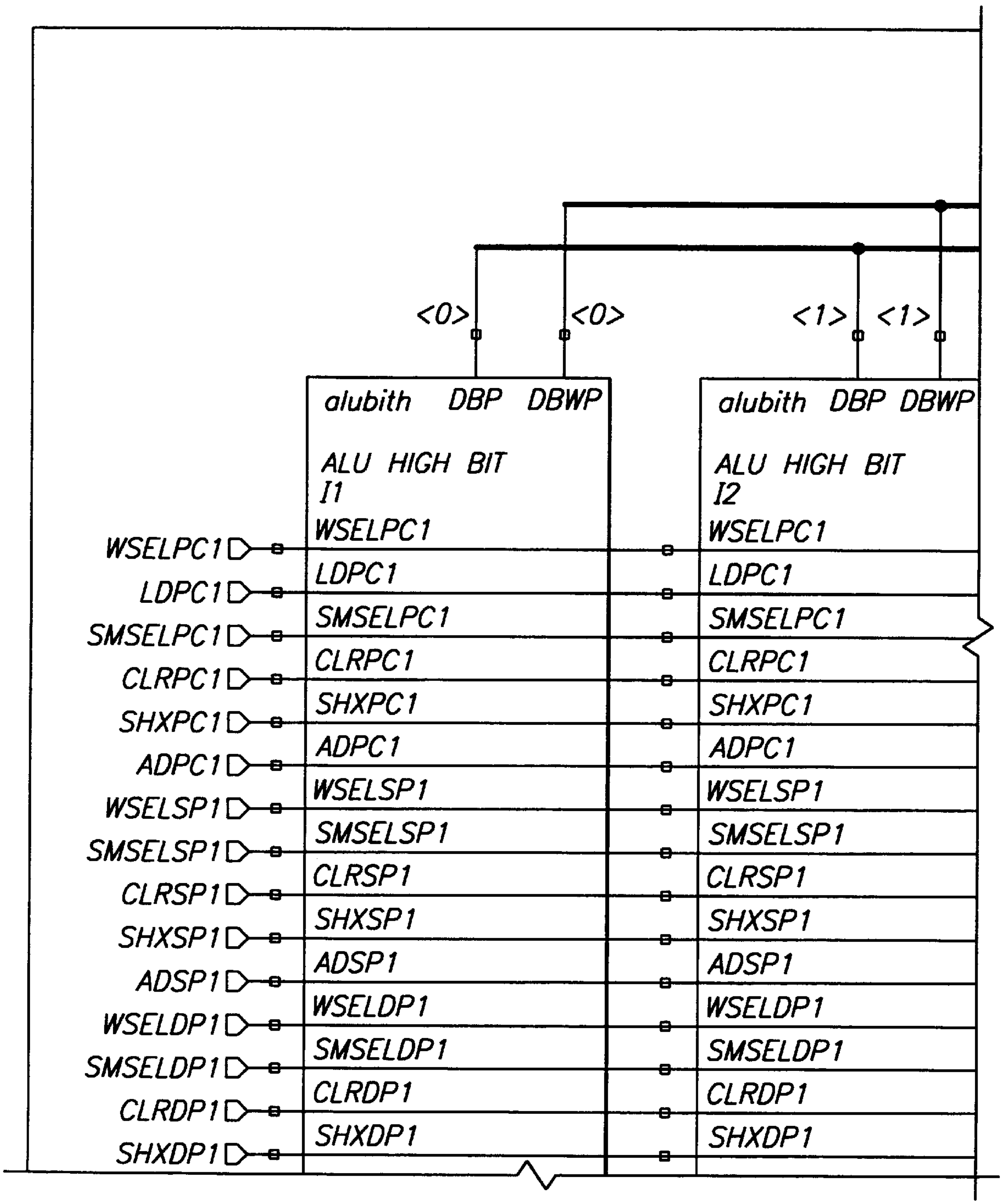
FIG 7.0902AA

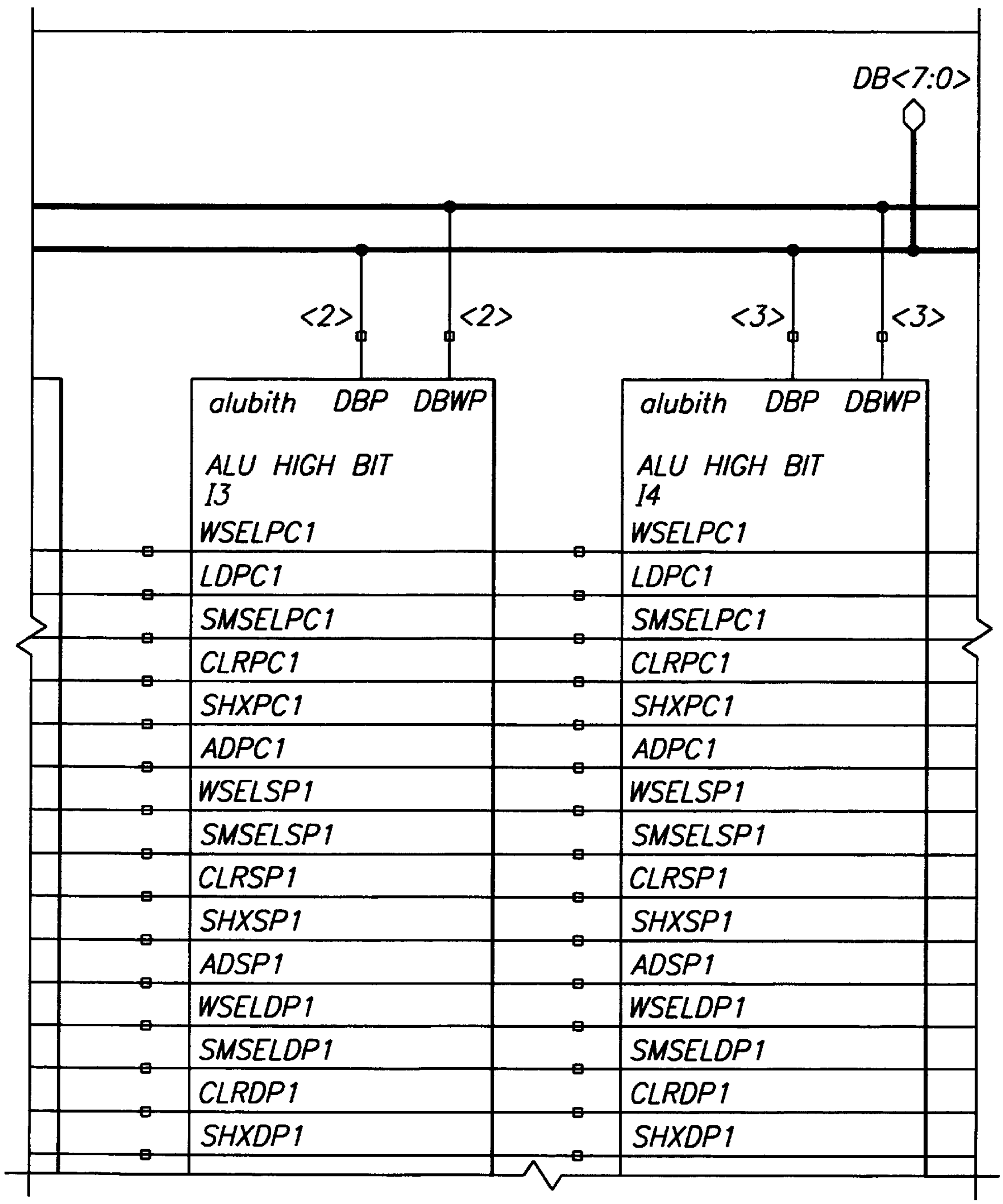
FIG 1.0902AB

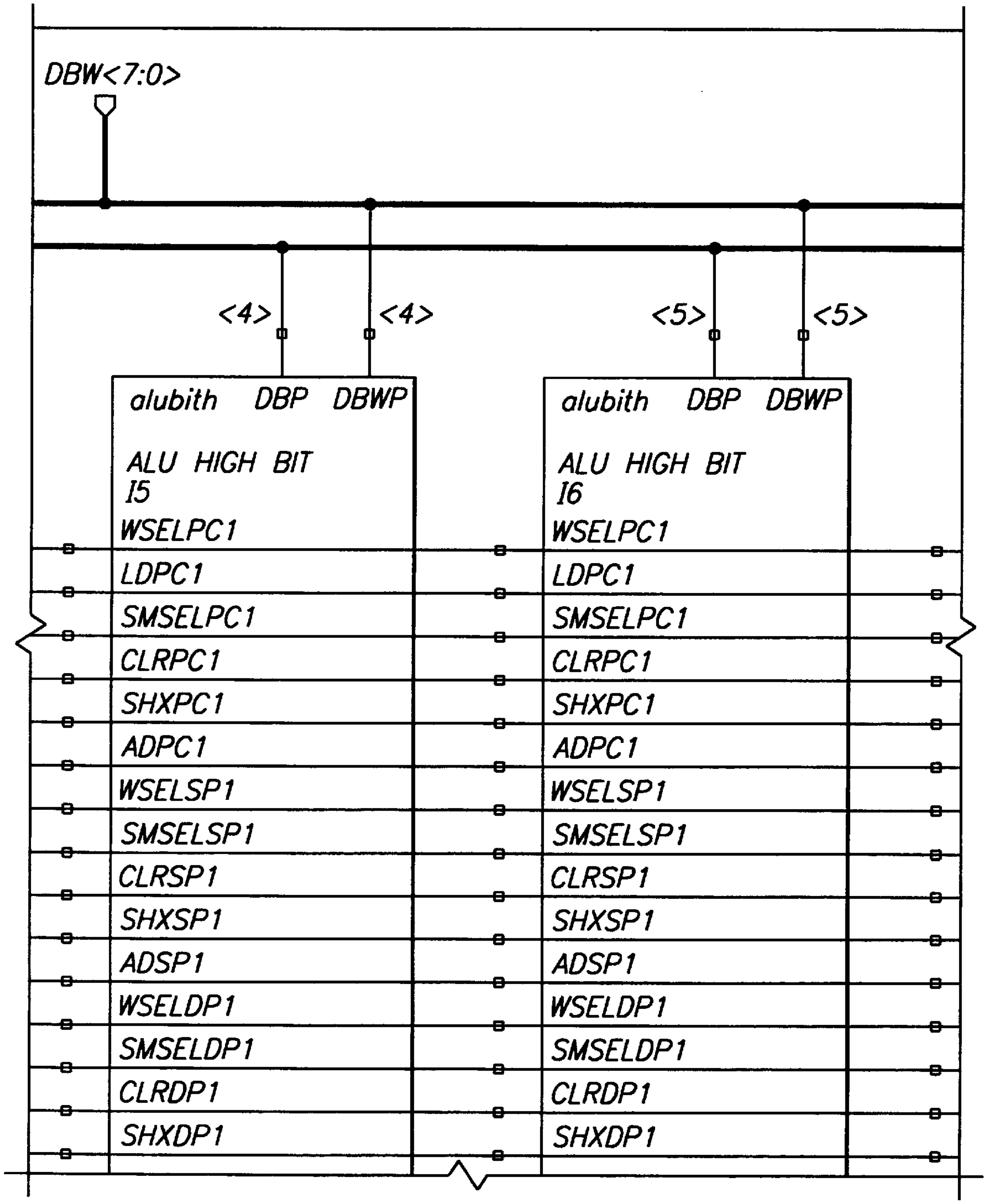
Fig 1.0902AC

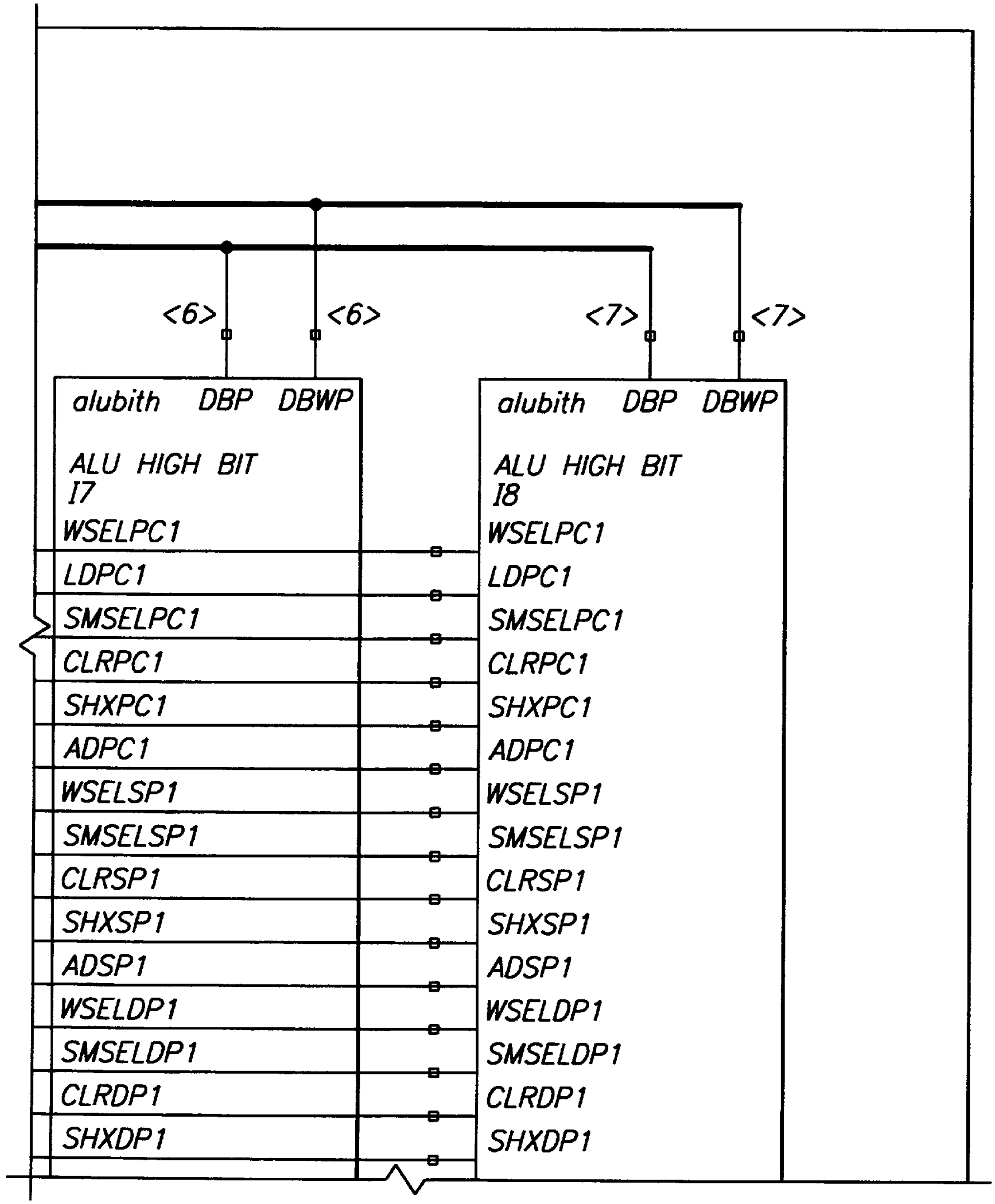
Fig 1.0902AD

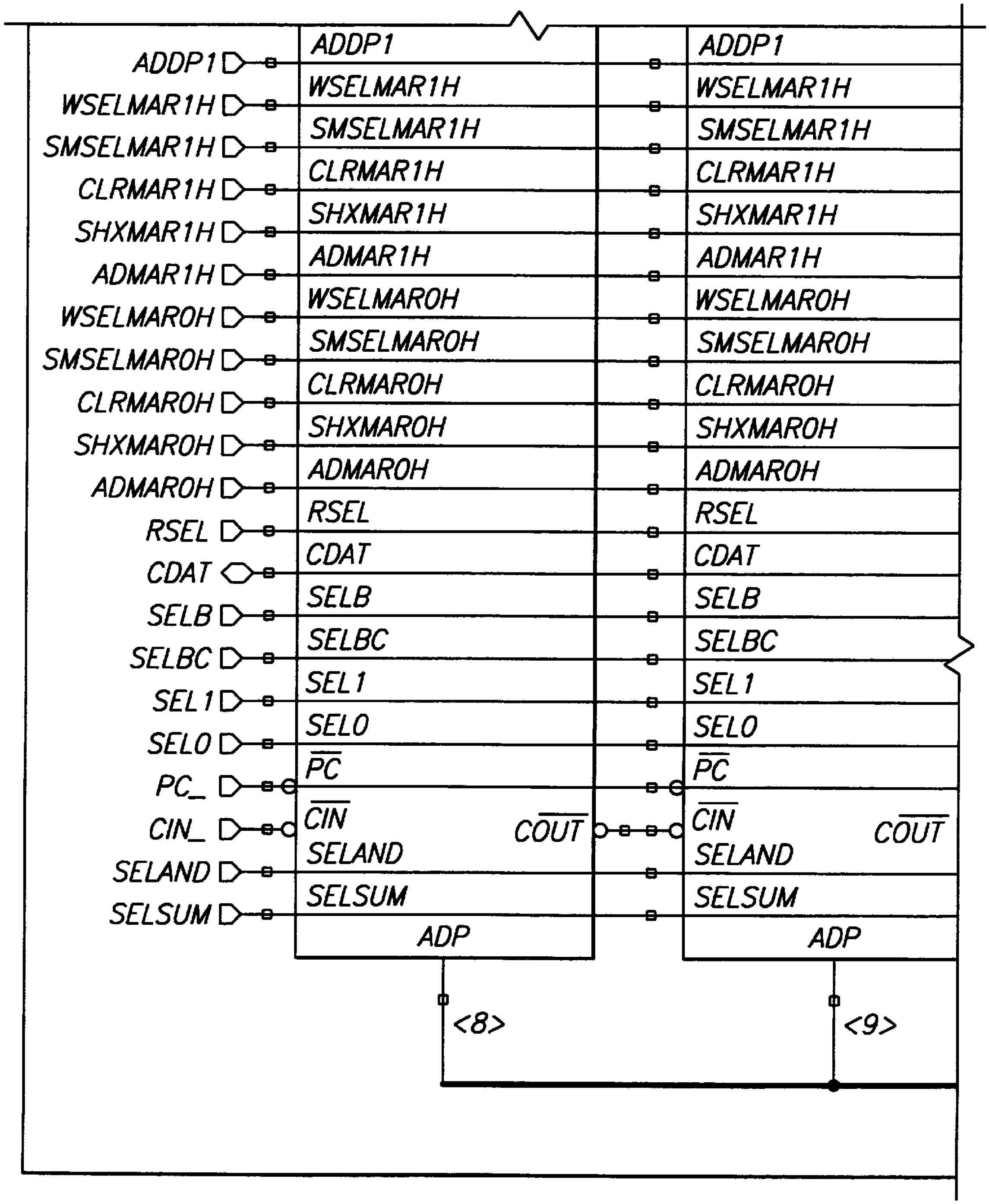
Fig 1.0902BA

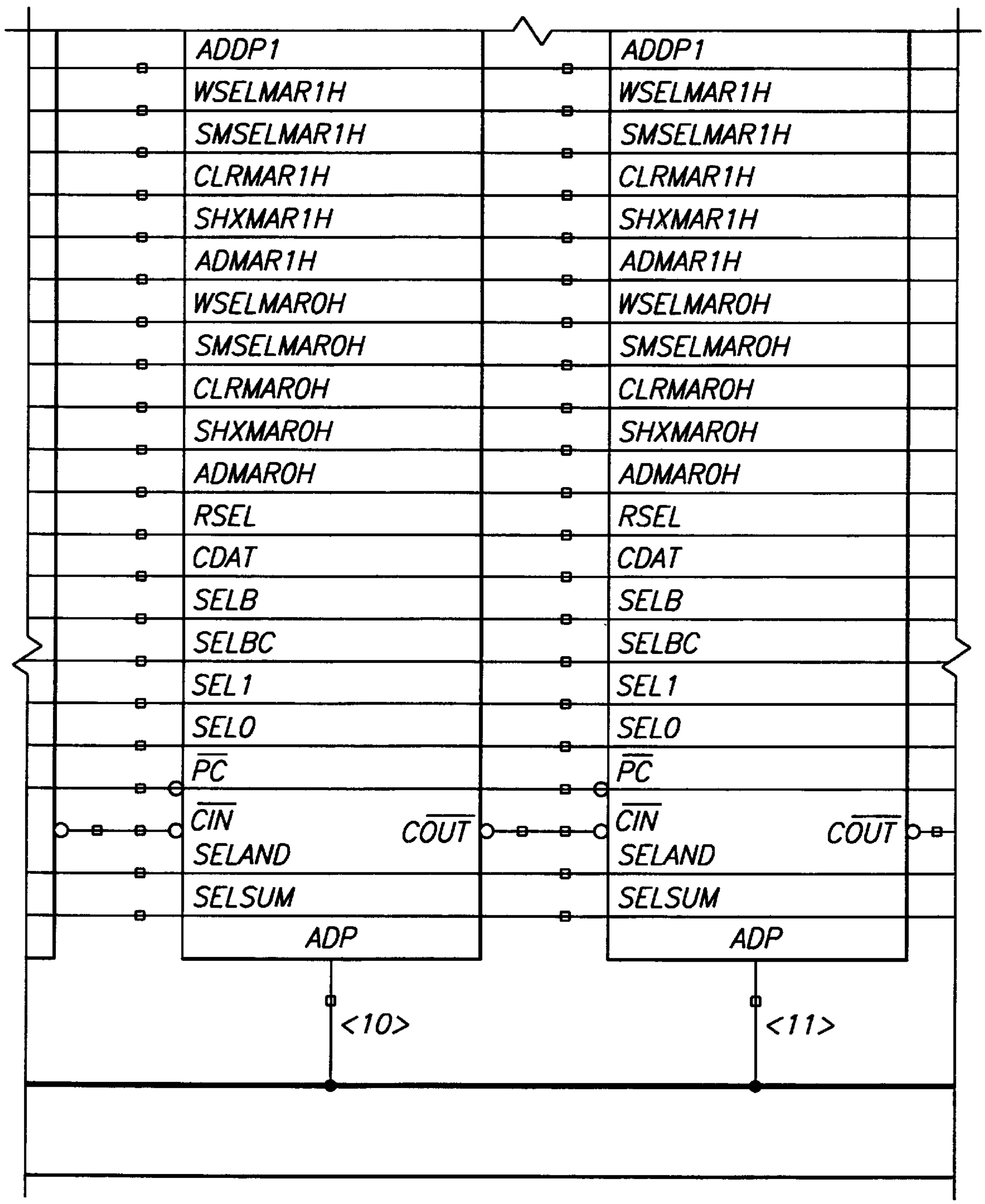
Fig. 1.0902BB

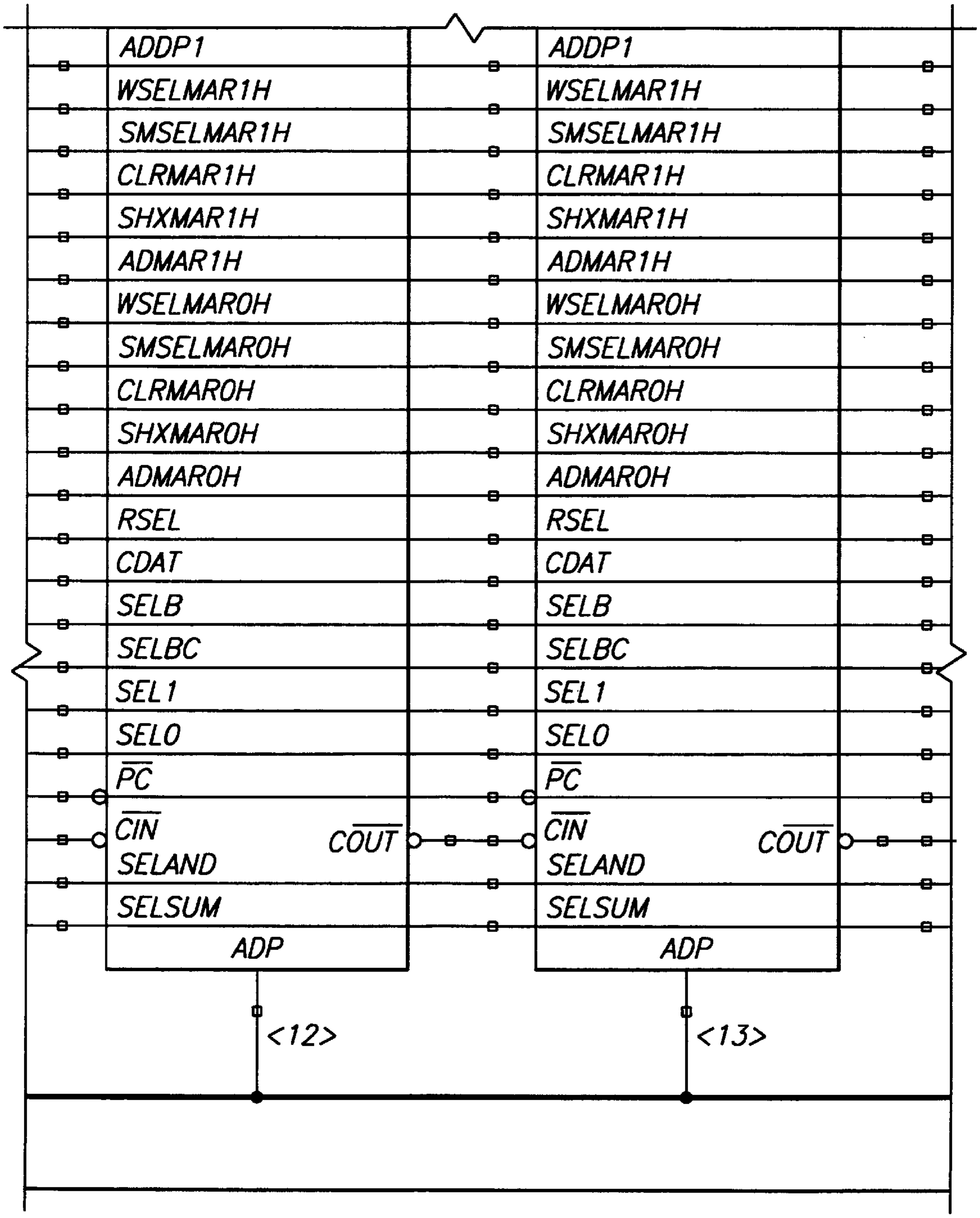
Fig 7.0902BC

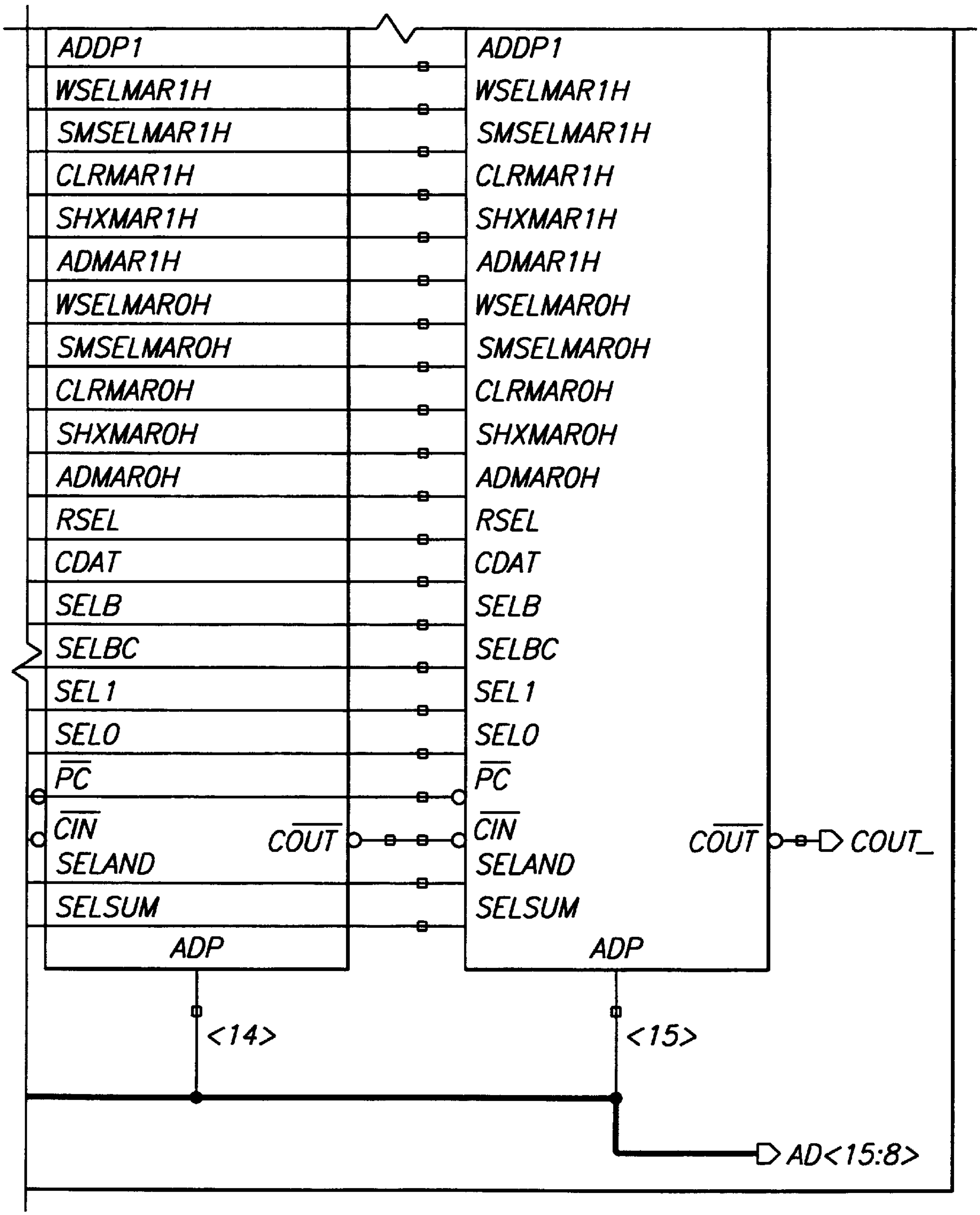
Fig 1.0902BD

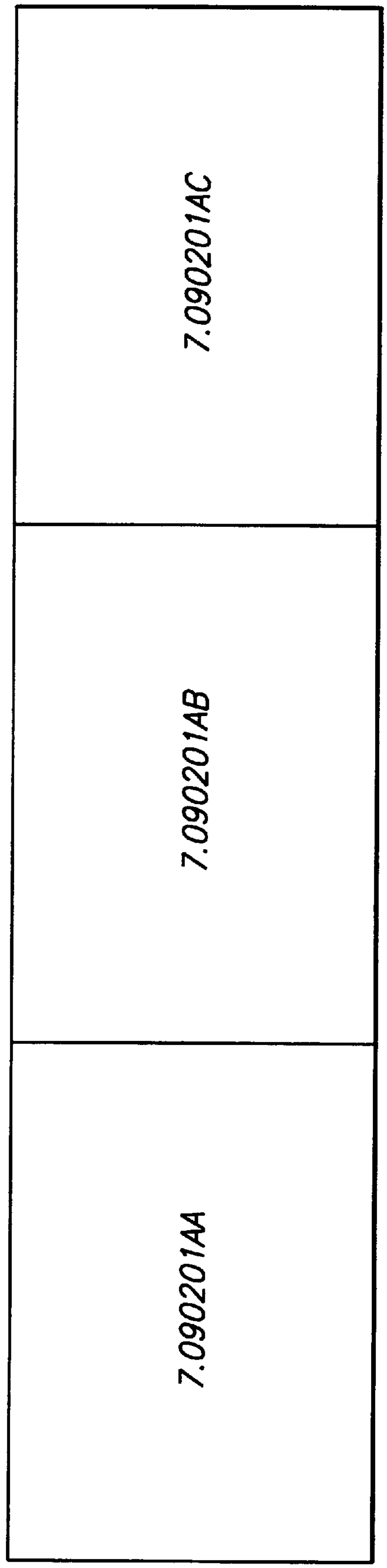
FIG 7.090201

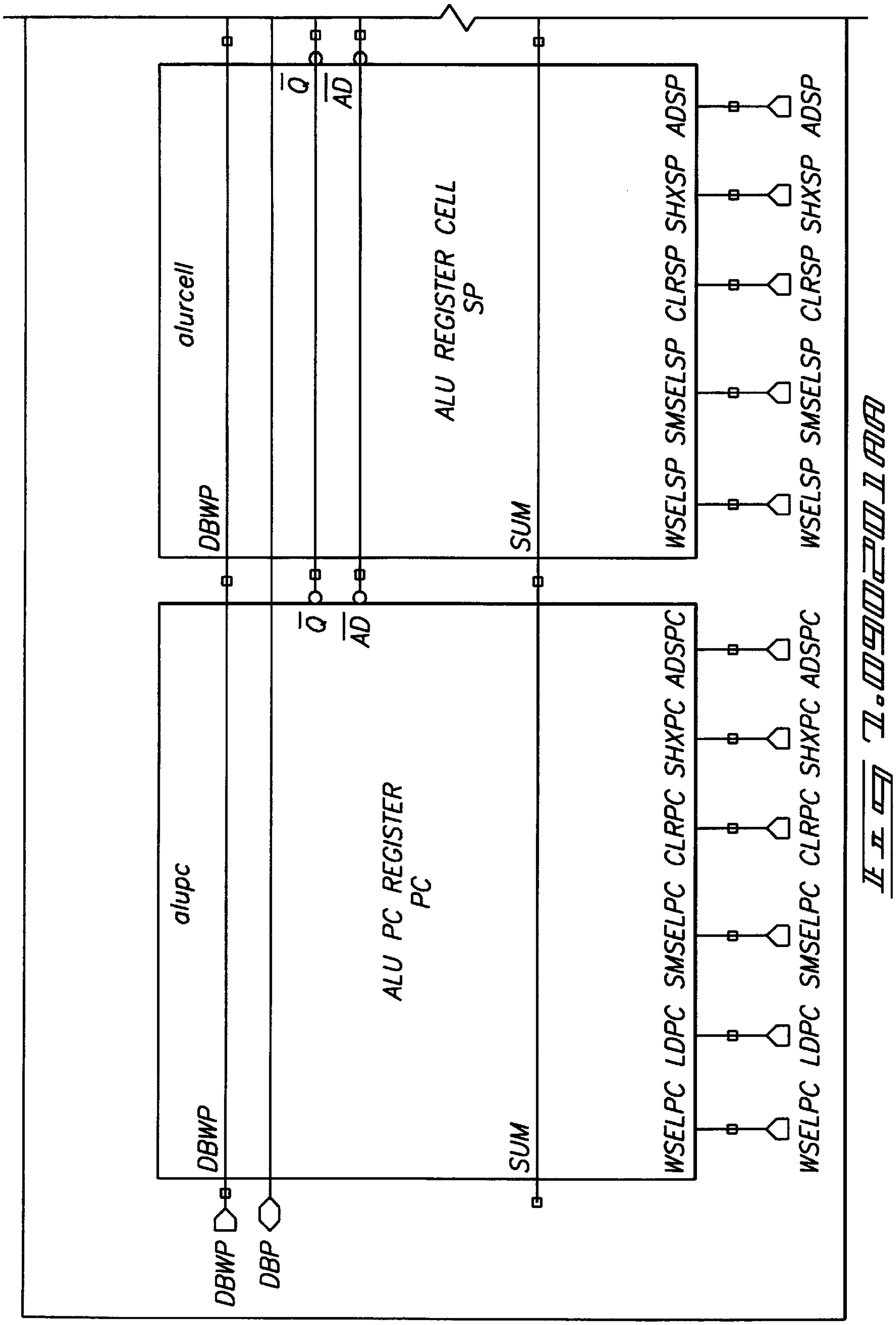
FIG. 7.090201AA

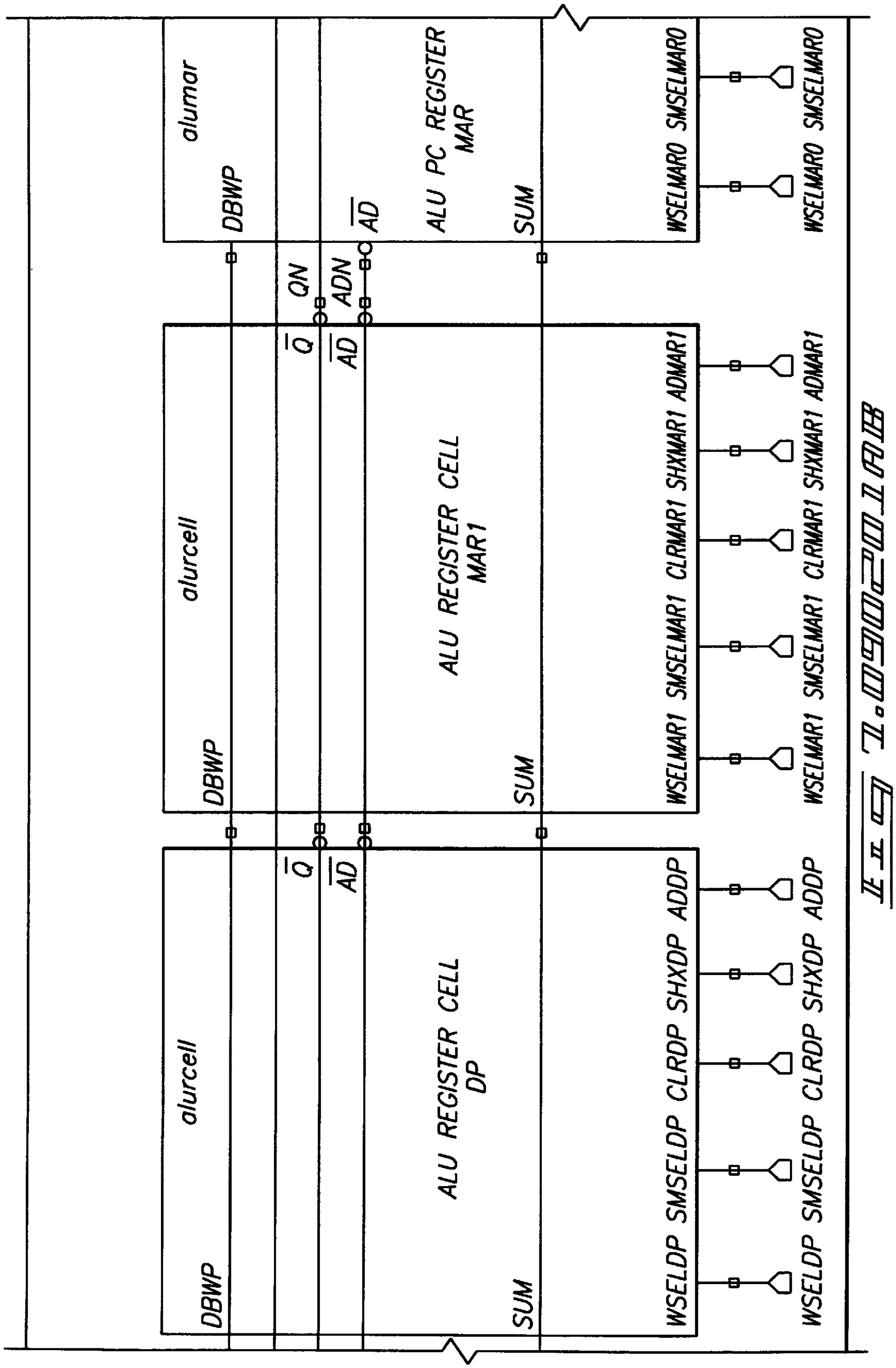
FIG. 7.09020AE

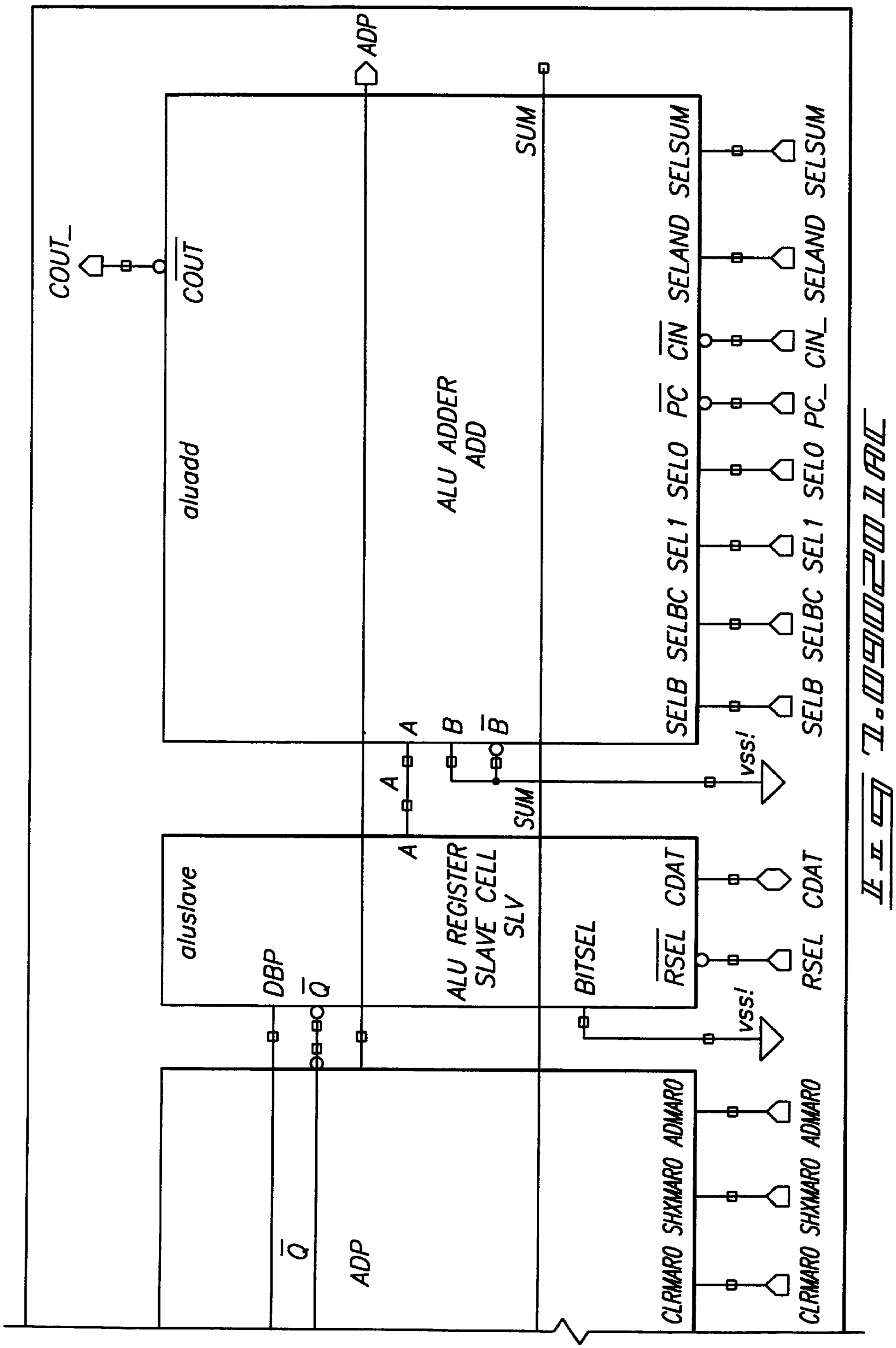
Fig. 1.0090201AC

| | | |
|---|---|---|
| 7.10AA | 7.10AB | 7.10AC |
| 7.10BA | 7.10BB | 7.10BC |
| 7.10CA | 7.10CB | 7.10CC |

Fig. 7.10

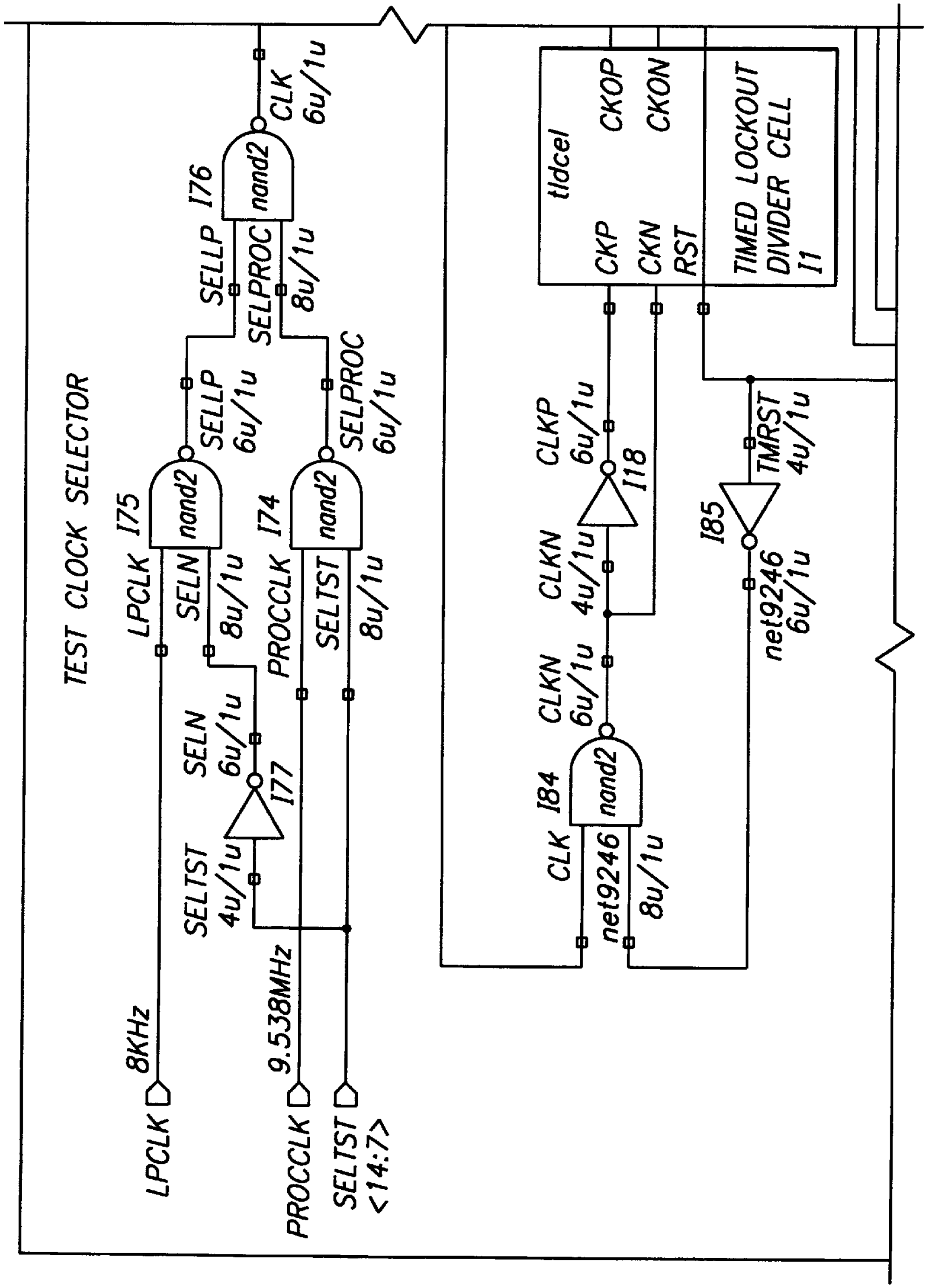
FIG. 7.100AA

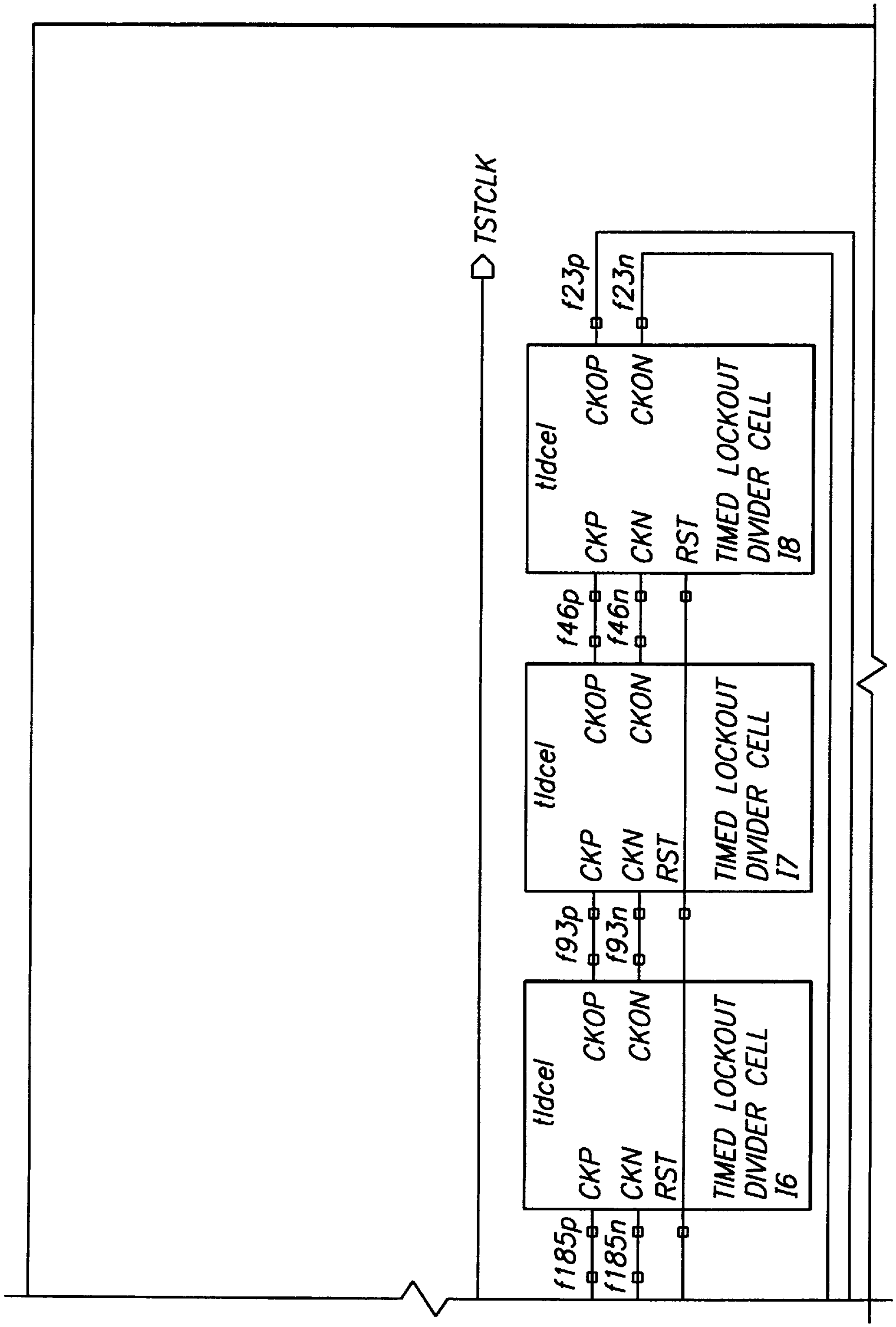
FIG. 7.10AC

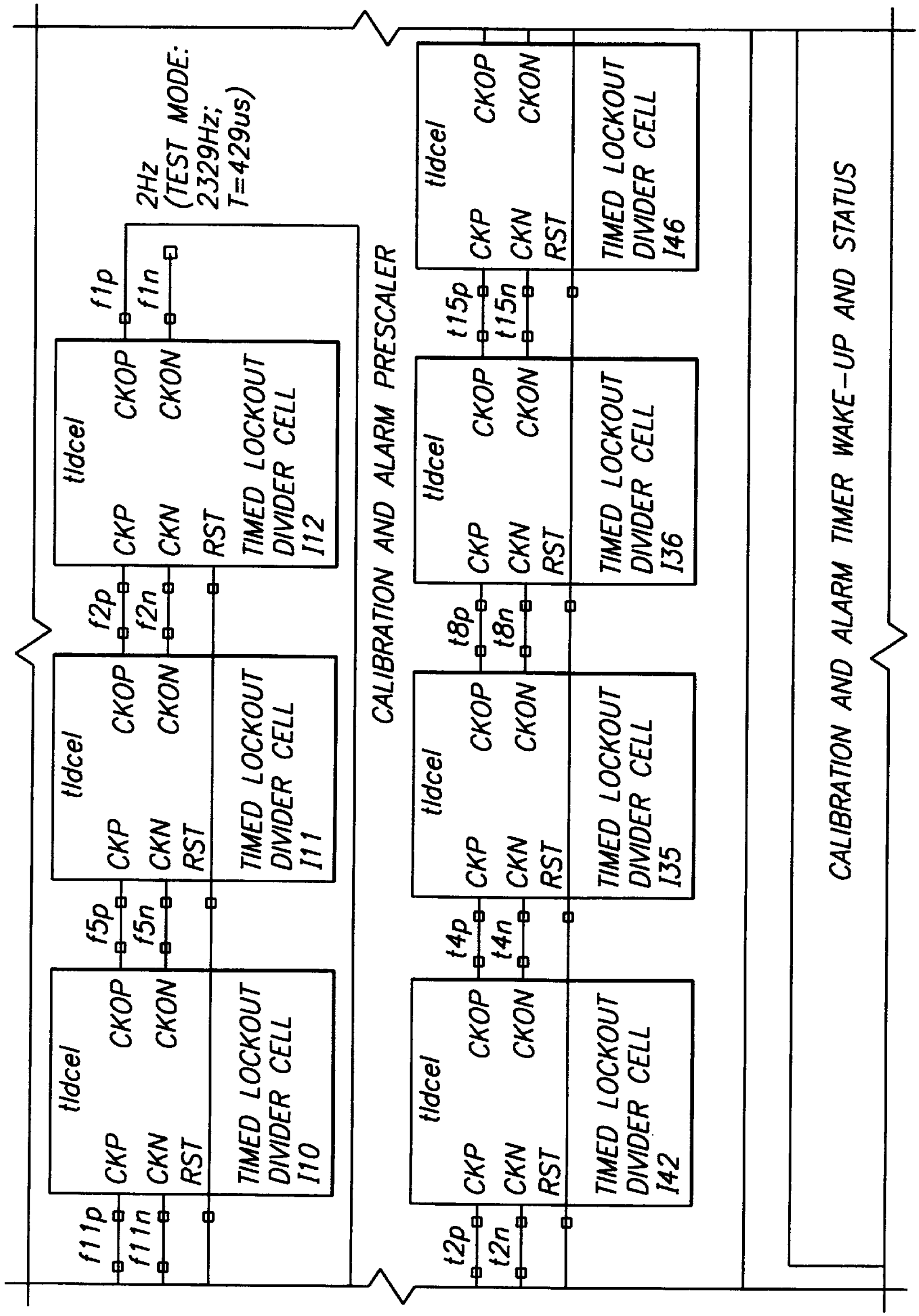
FIG. 7.10BB

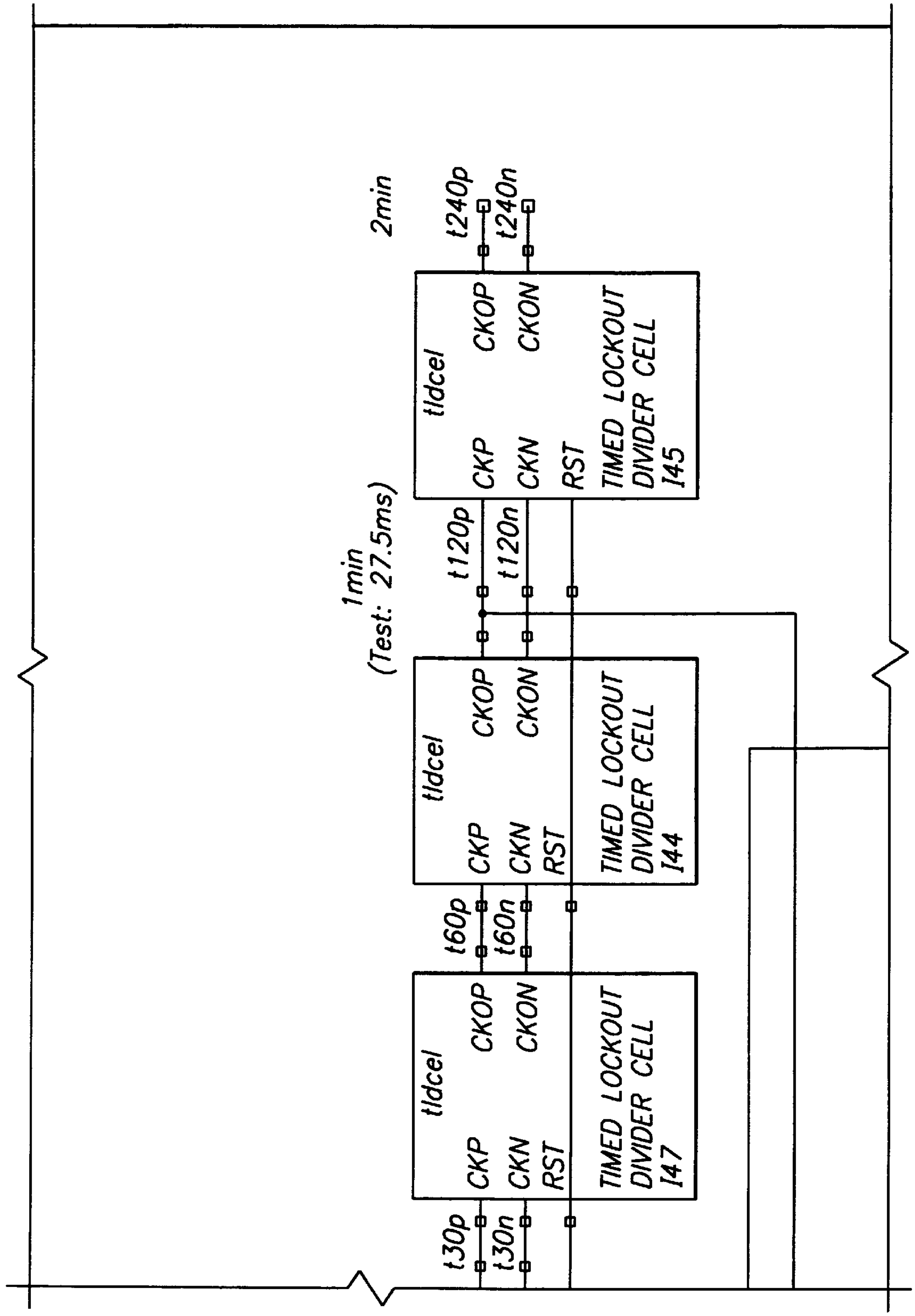
FIG. 7.10BC

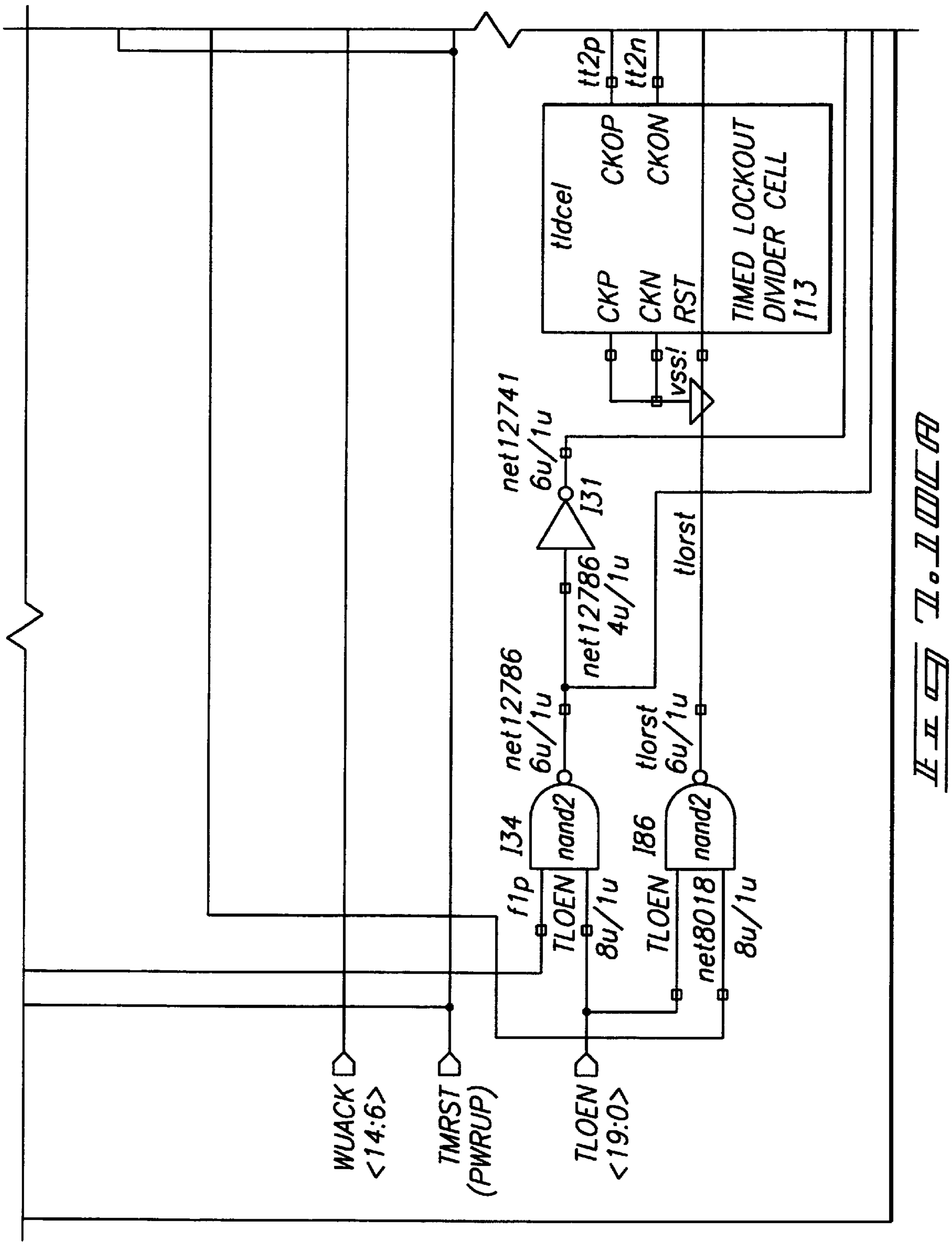
FIG. 7.10CA

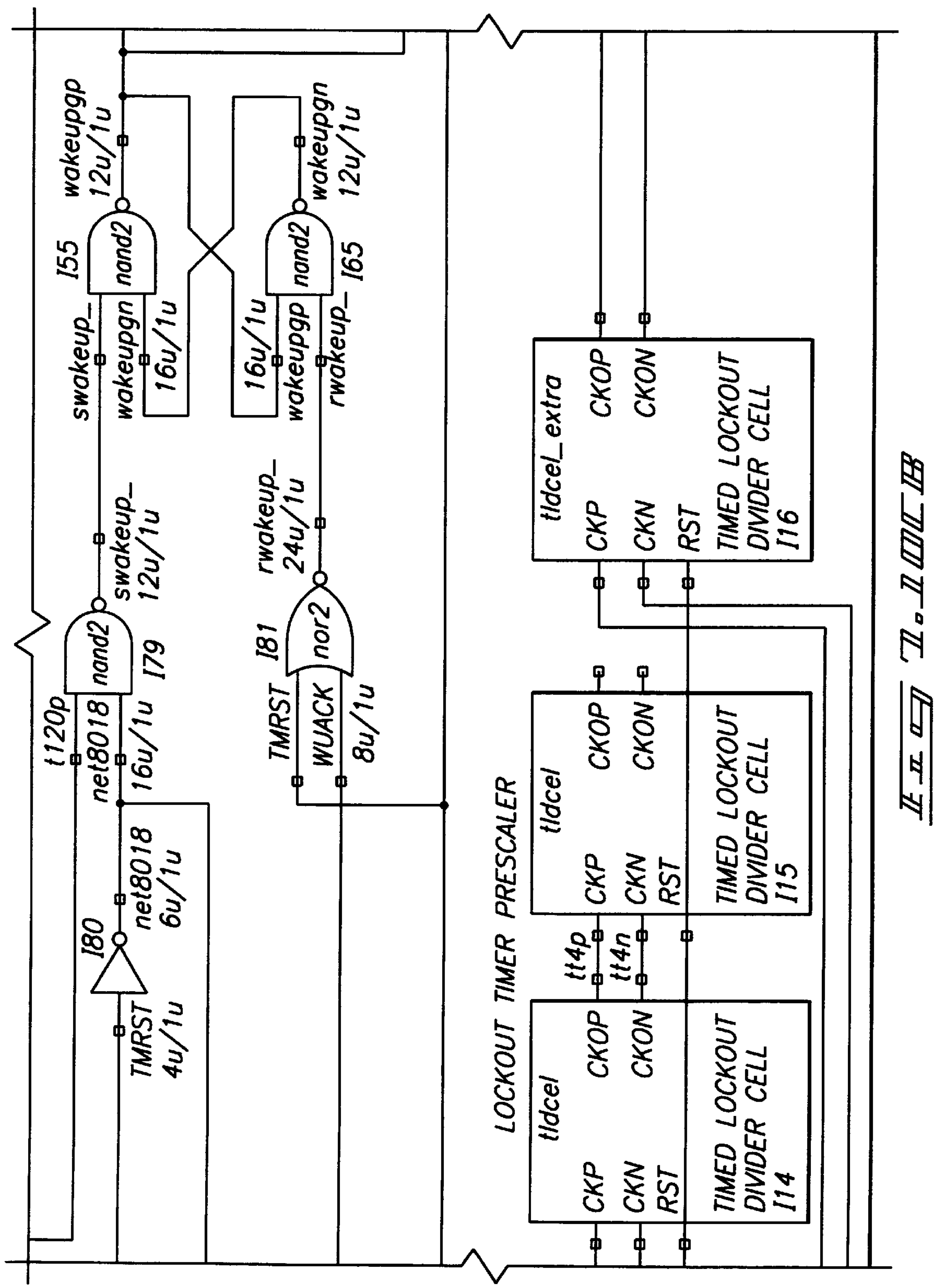
FIG. 7.10CB

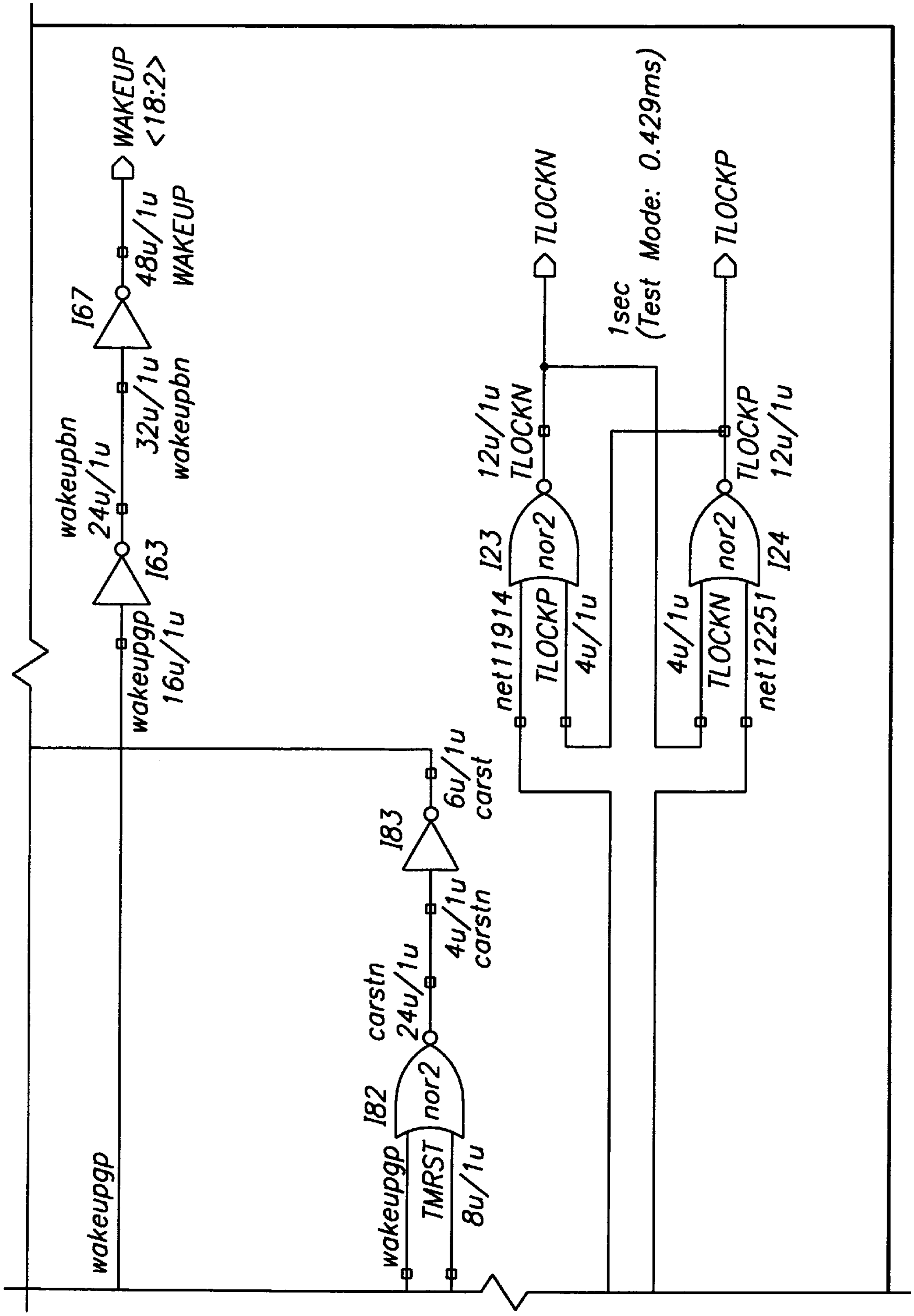
FIG. 1.10CC

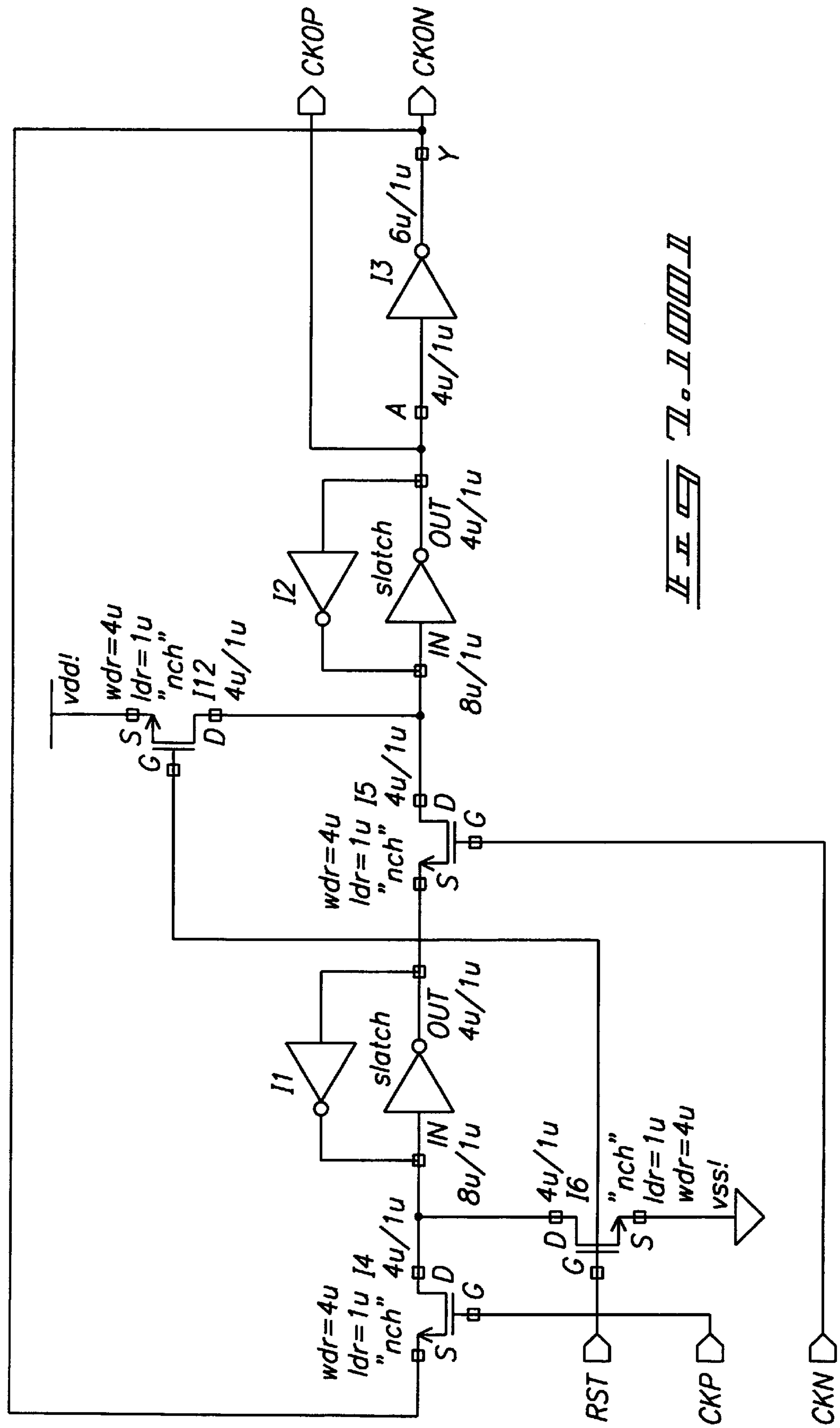
Fig. 1001

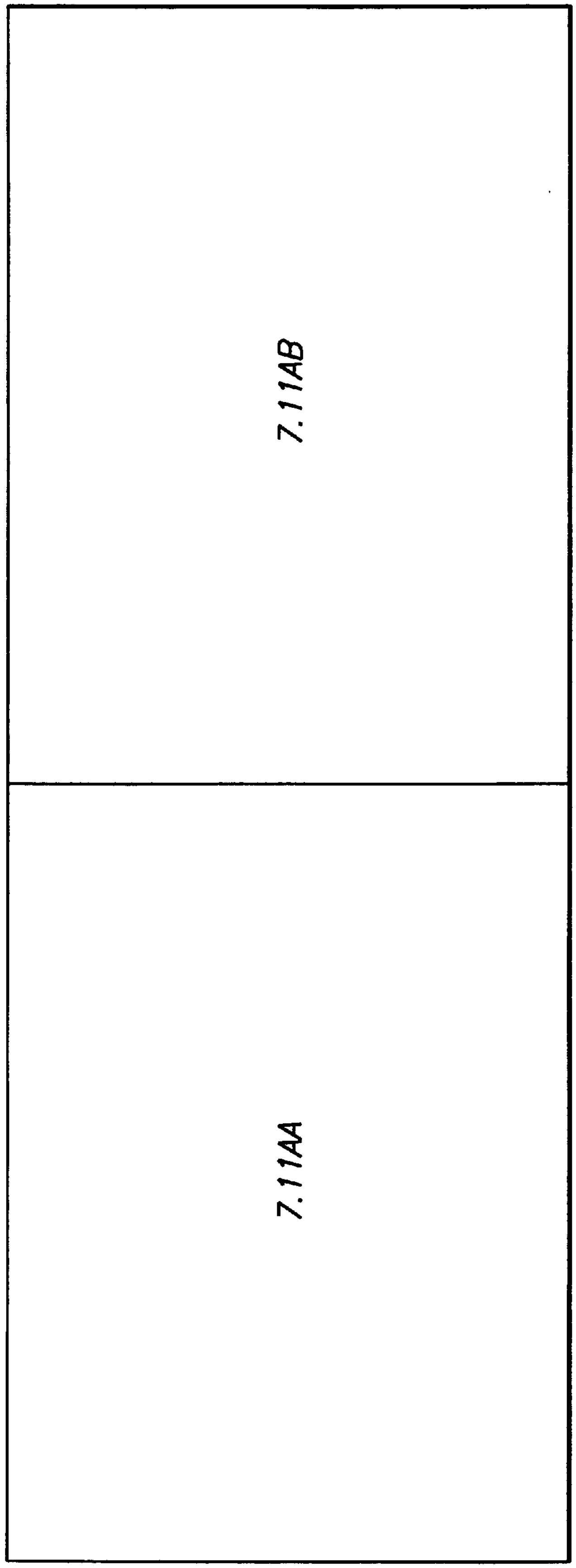
Fig. 7.11

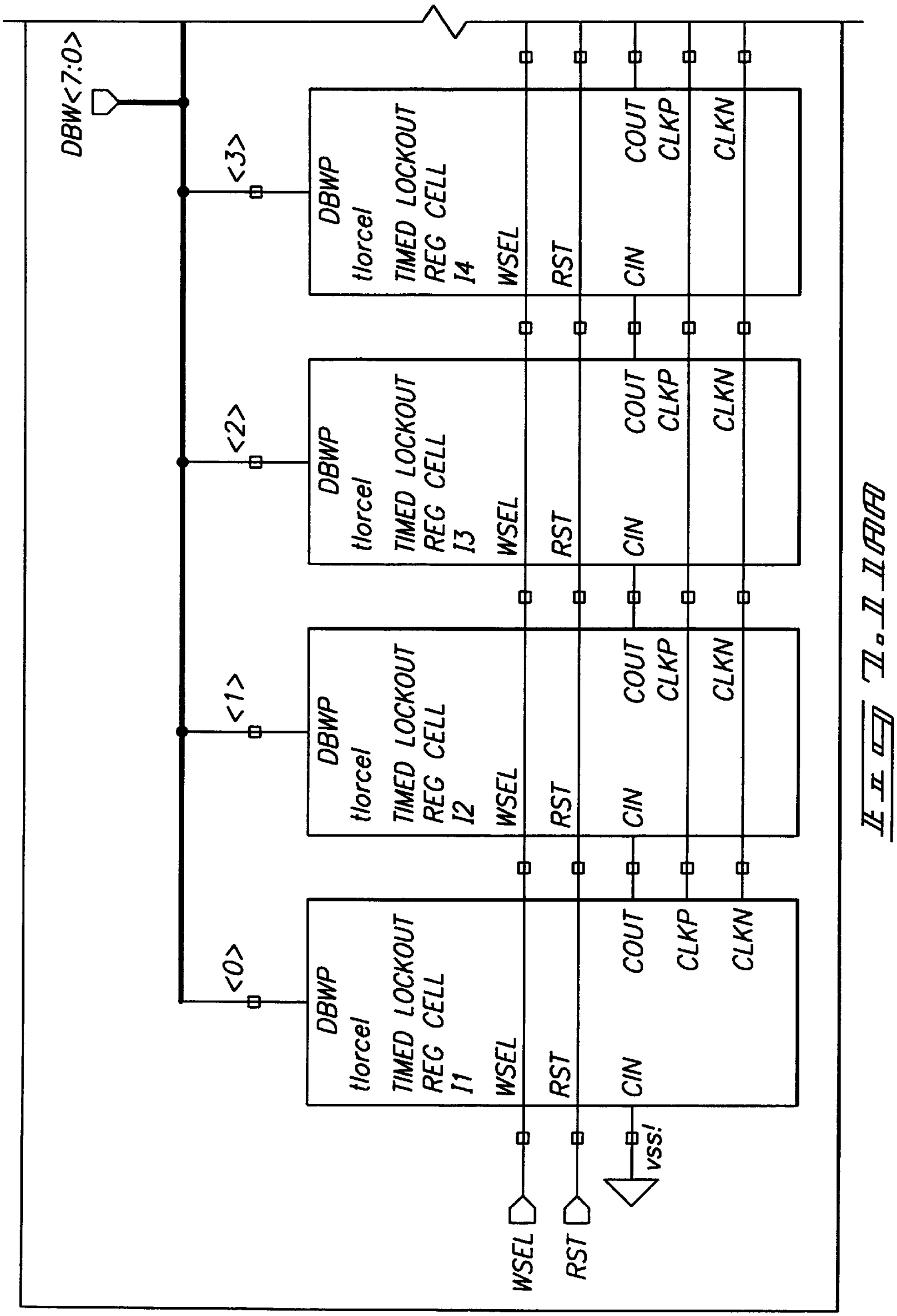
Fig. 7.11AA

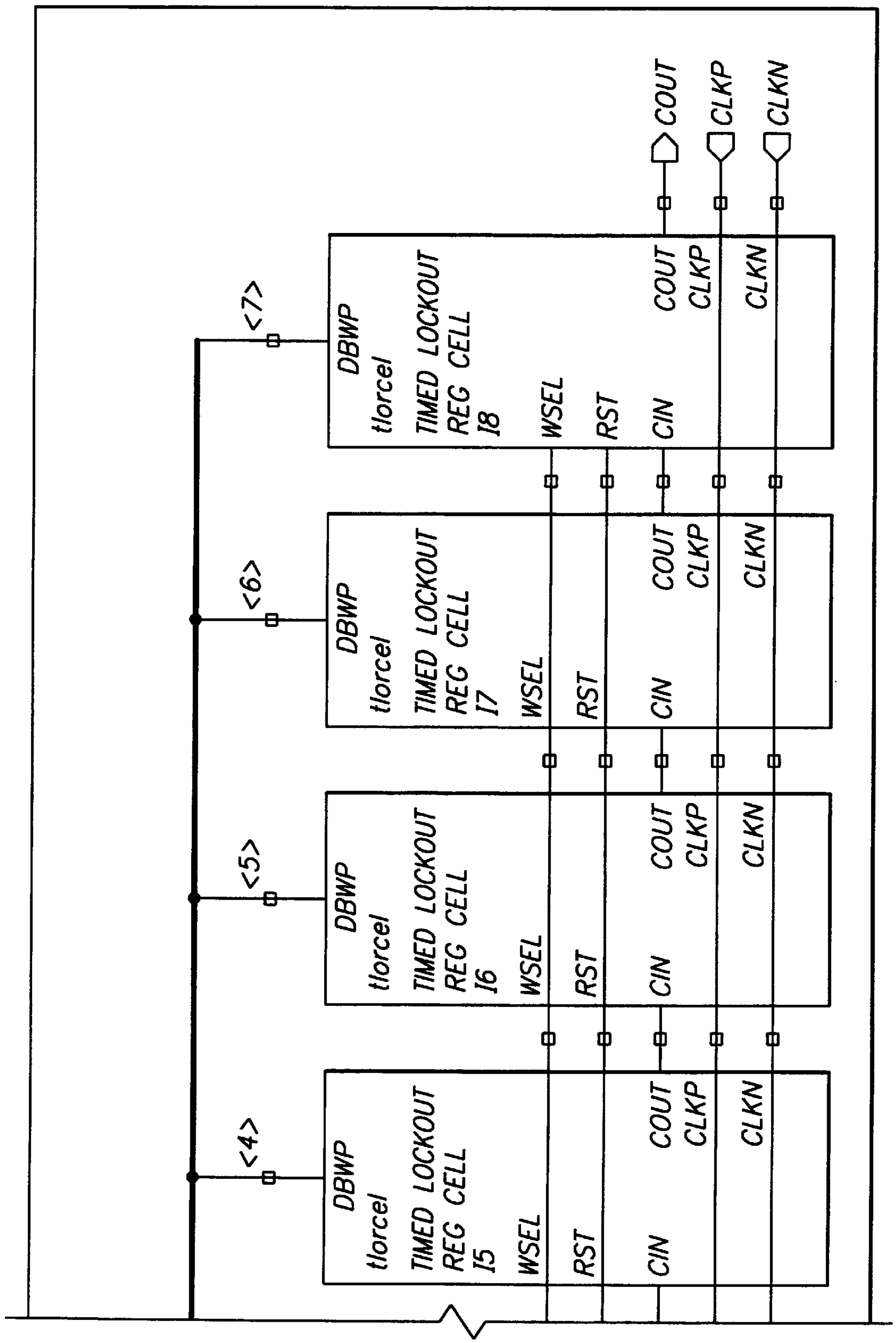
FIG. 7.1AB

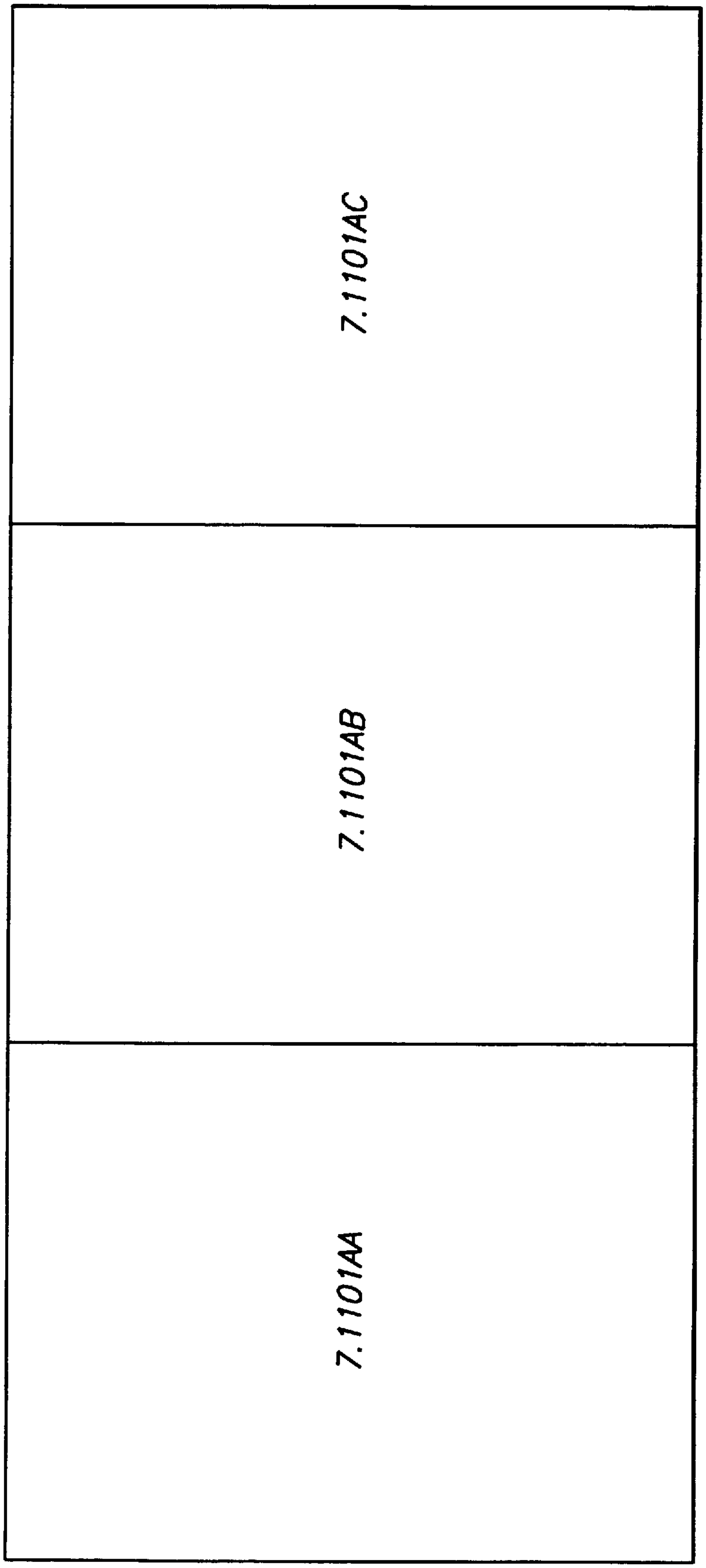
FIG. 7.1101

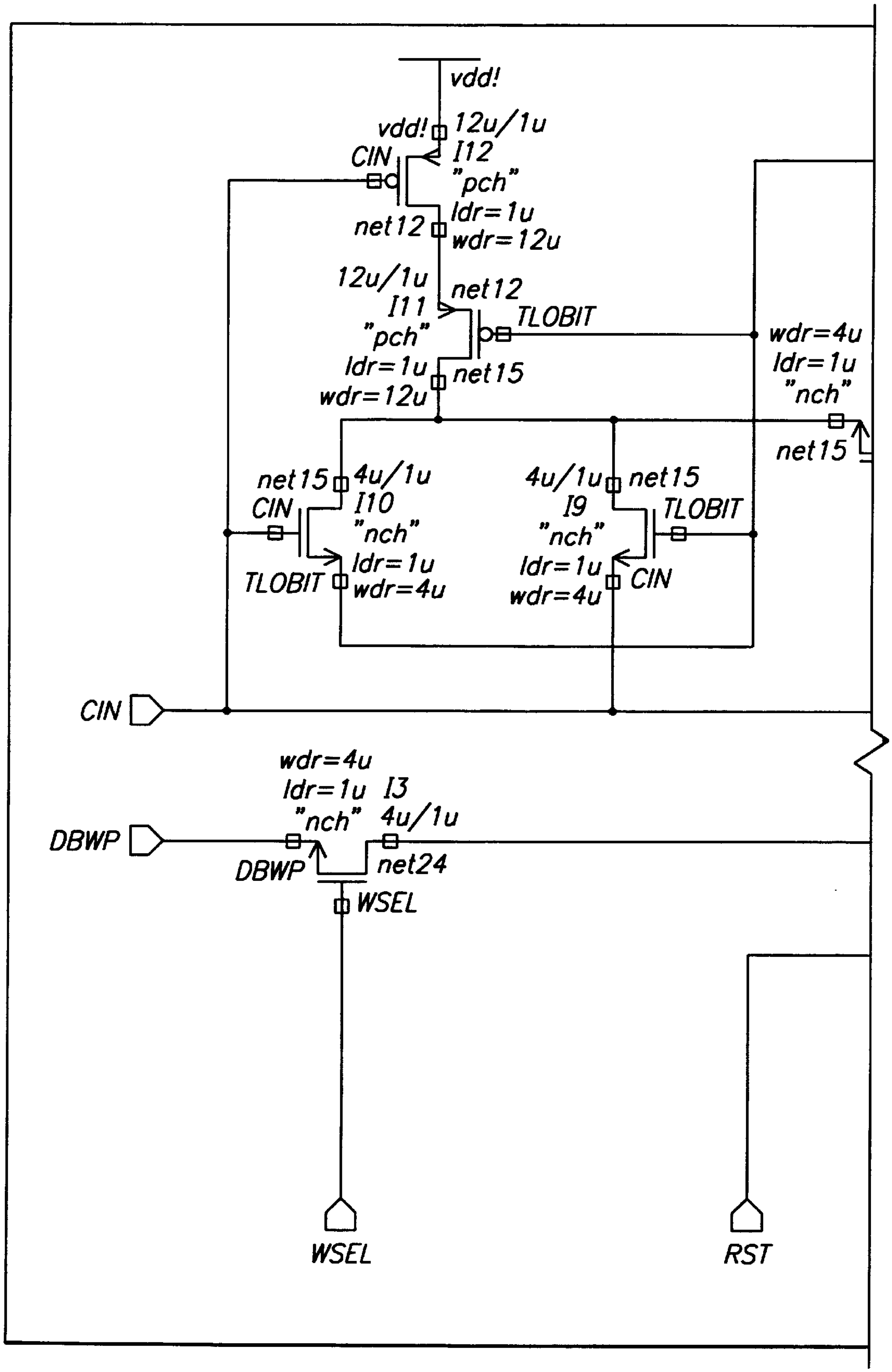
Fig. 1.11011AA

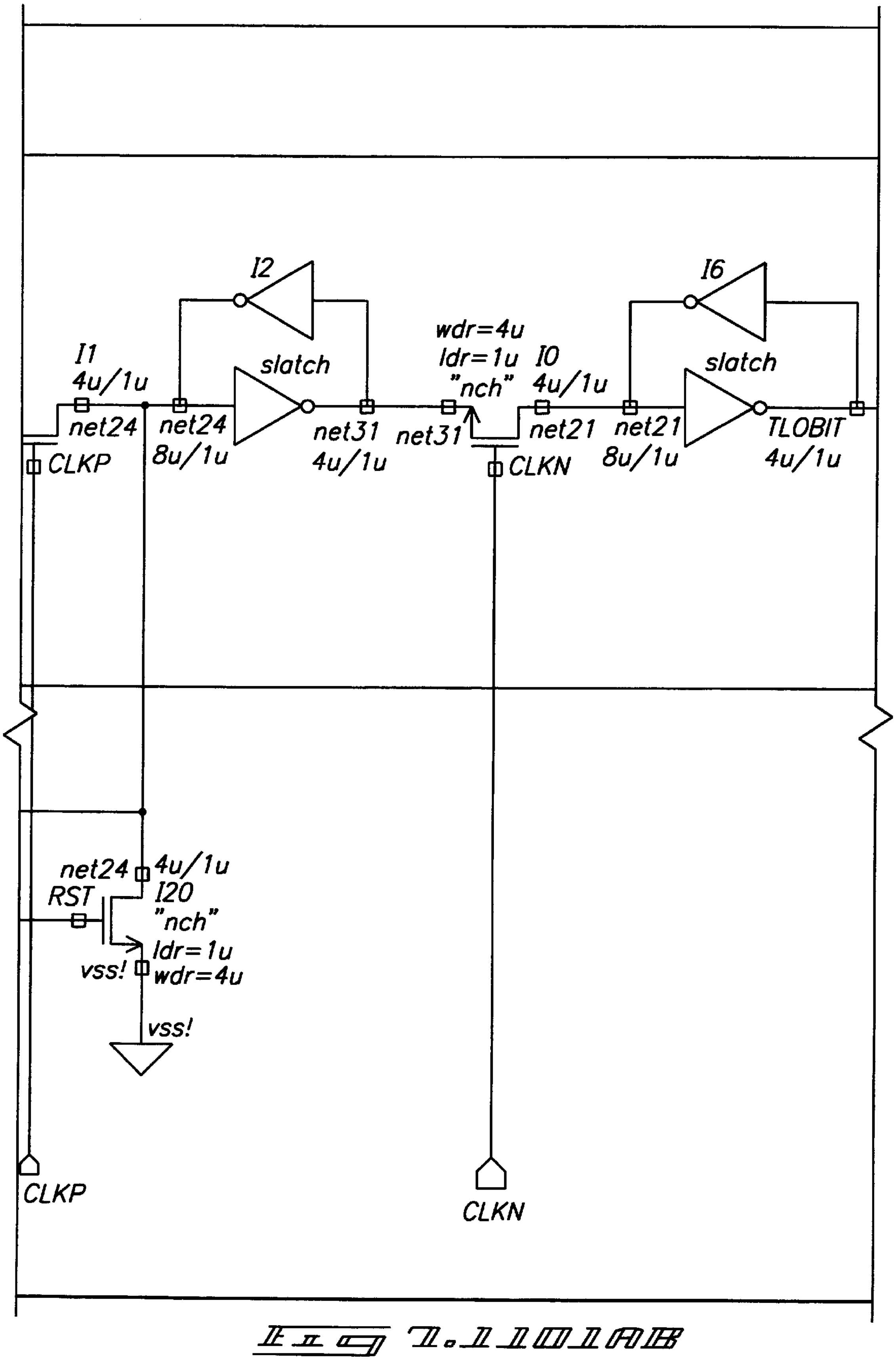
Fig 7.110AB

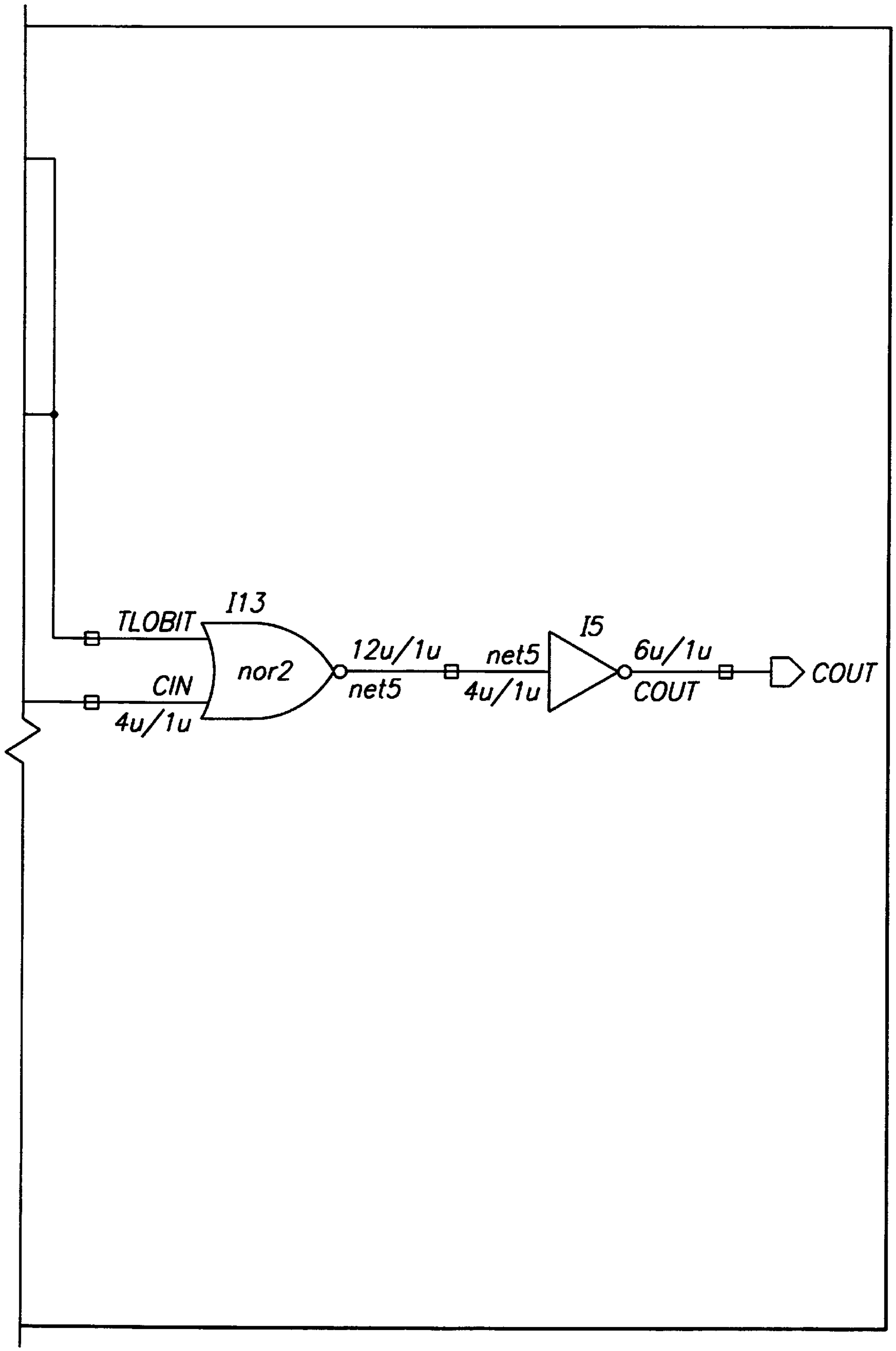
Fig. 7.110.1AC

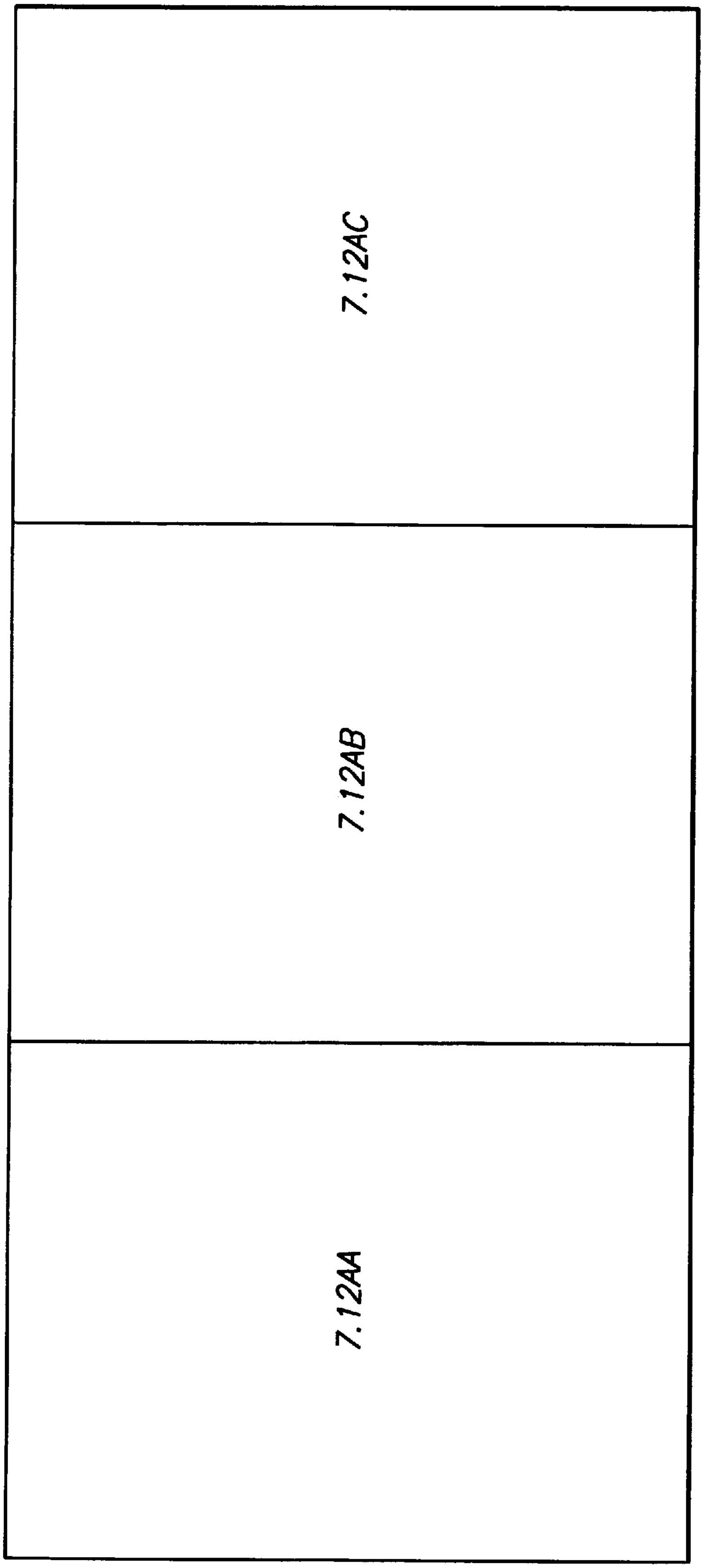
FIG. 7.12

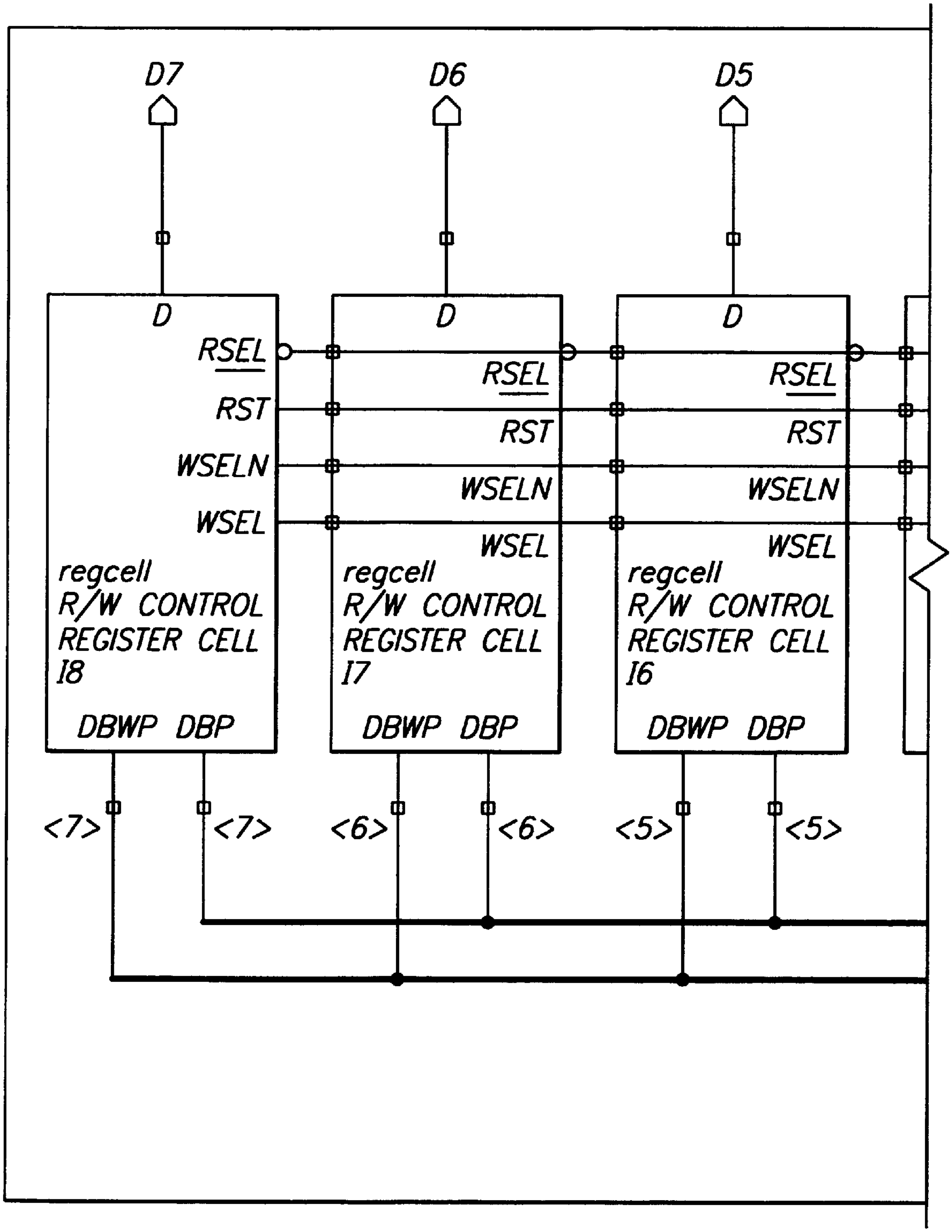
FIG 7.12AA

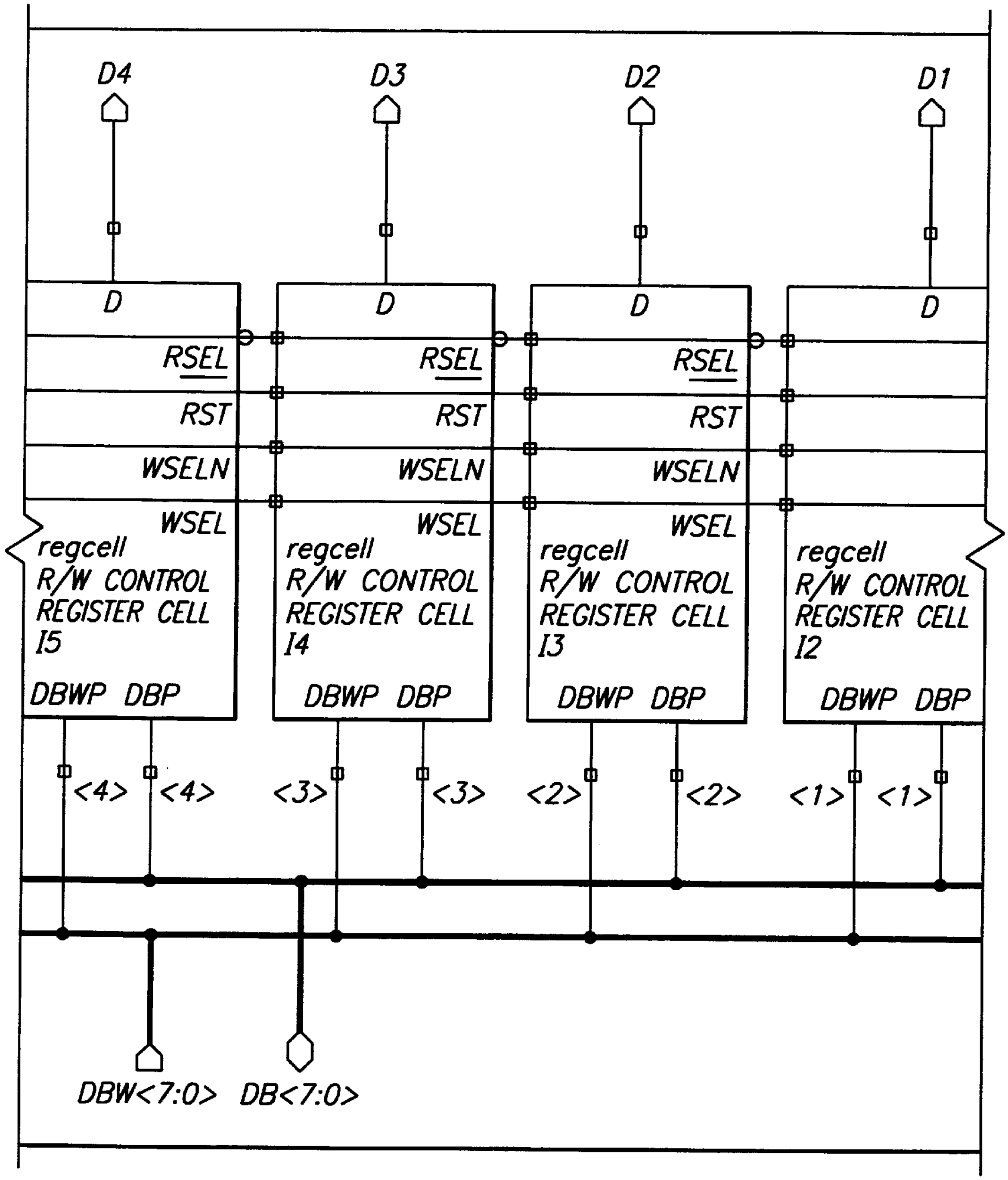
Fig 7.12AB

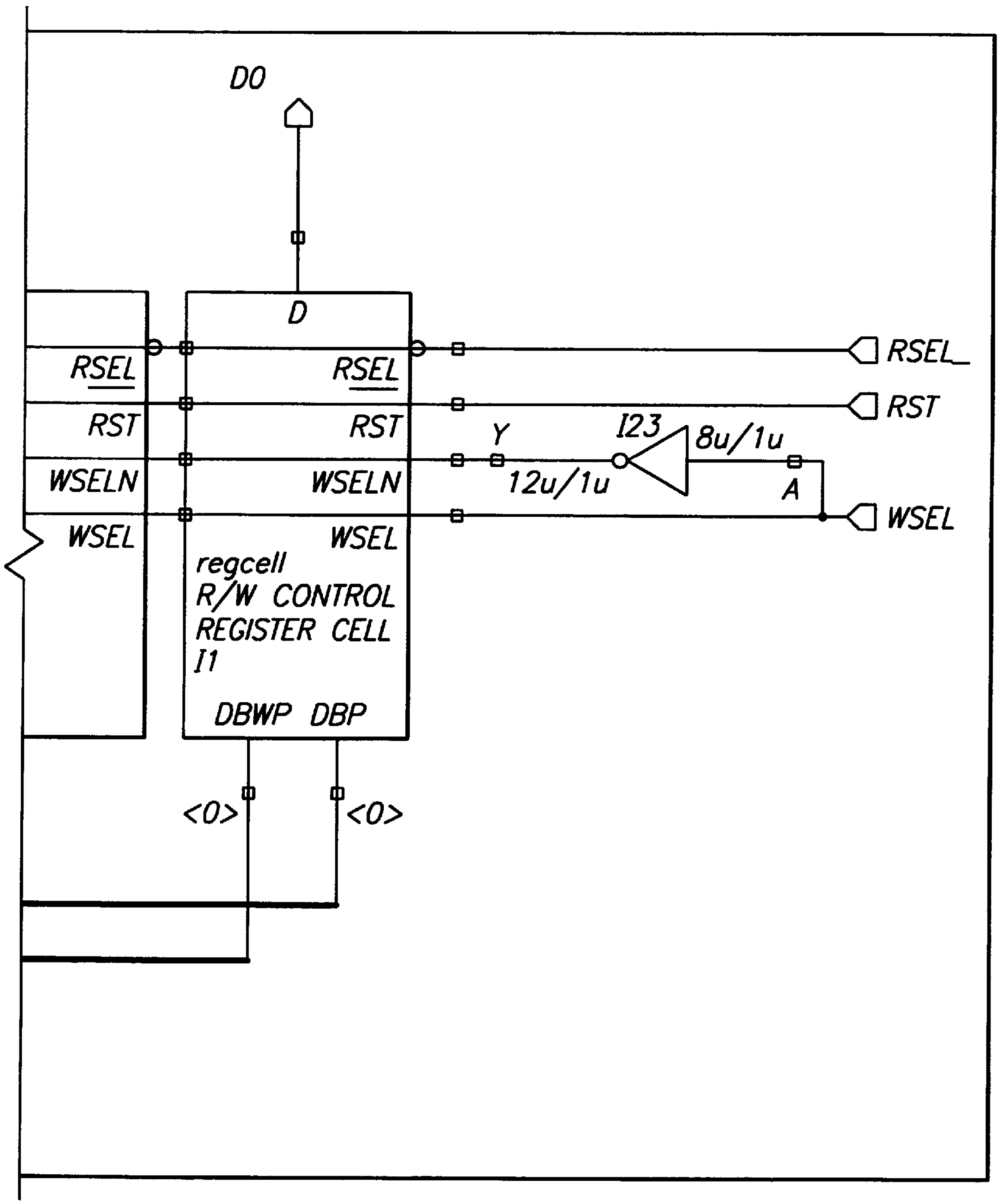
Fig 7.12AC

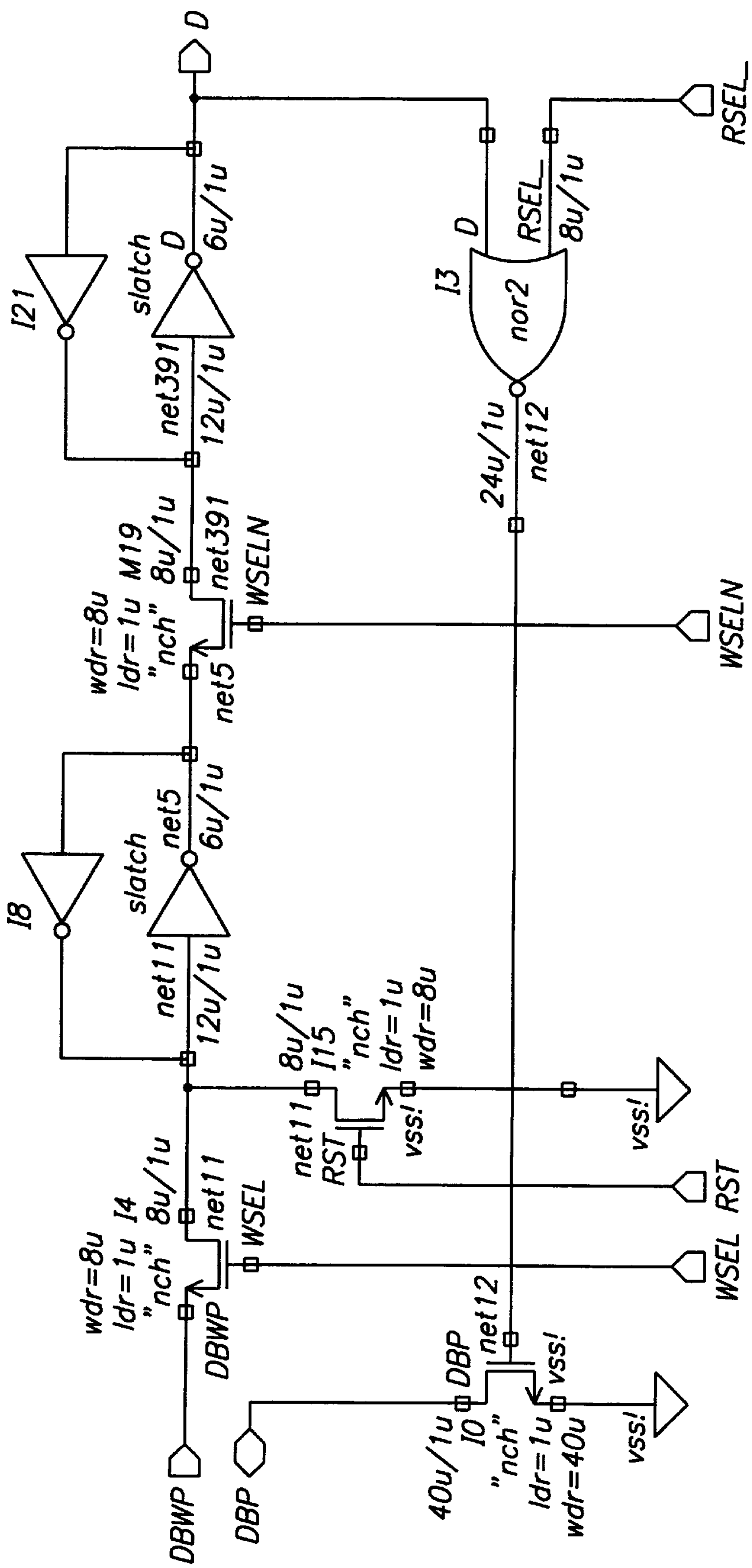
Fig. 1201

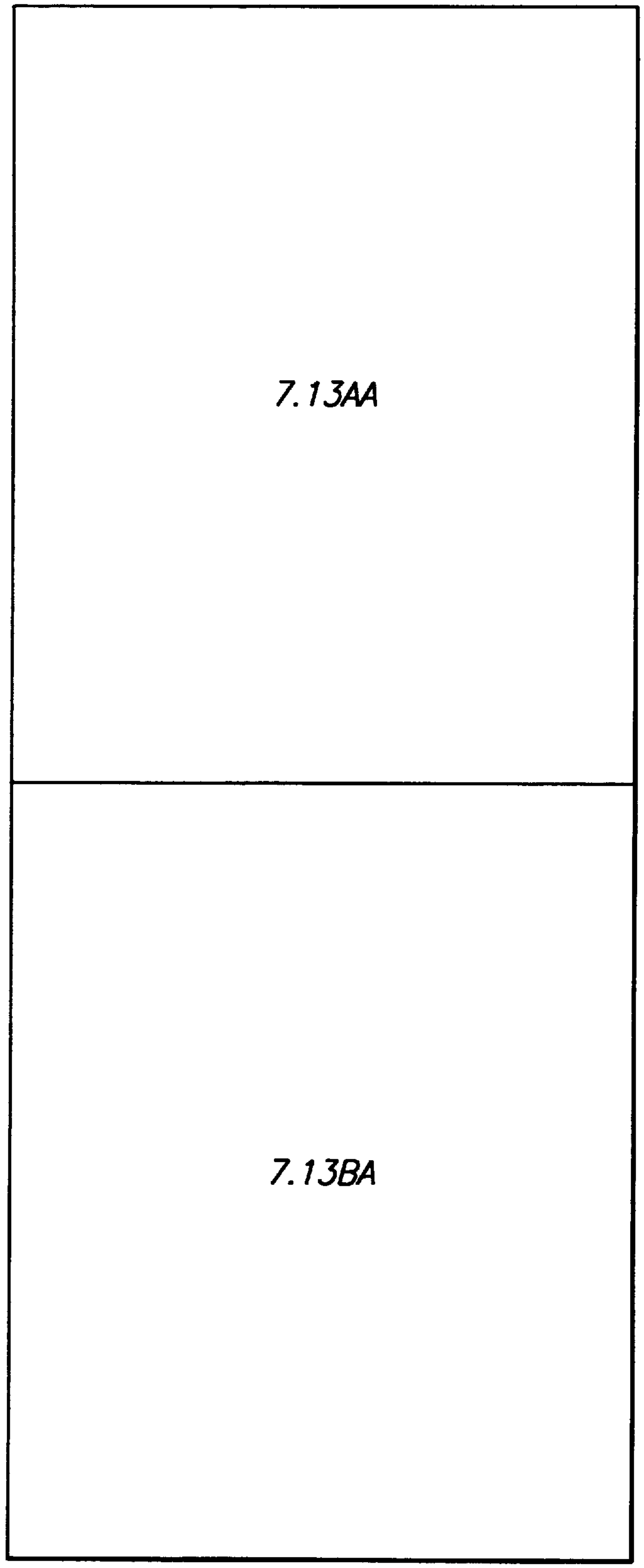
Fig. 7.13

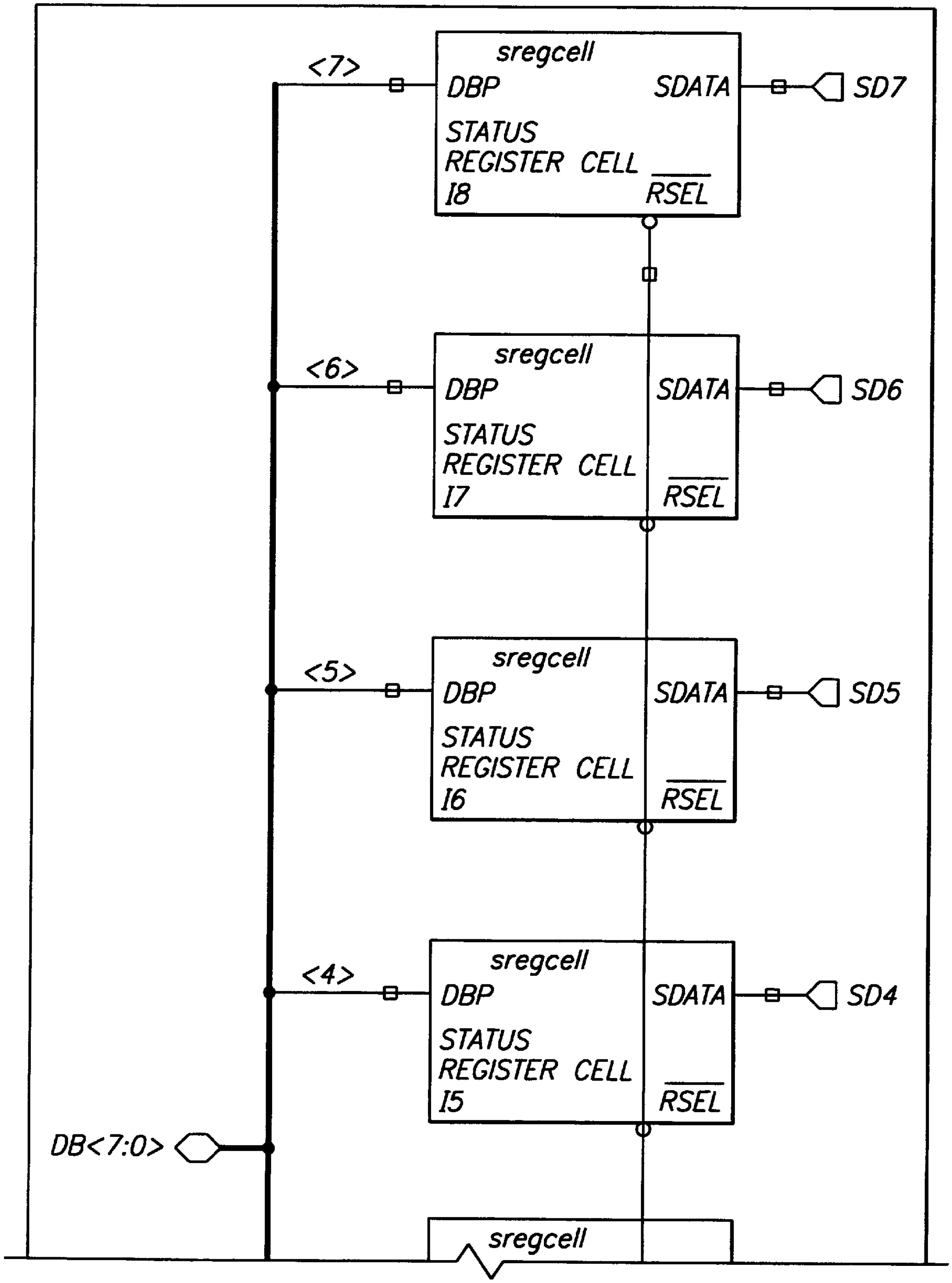
Fig 7.13AA

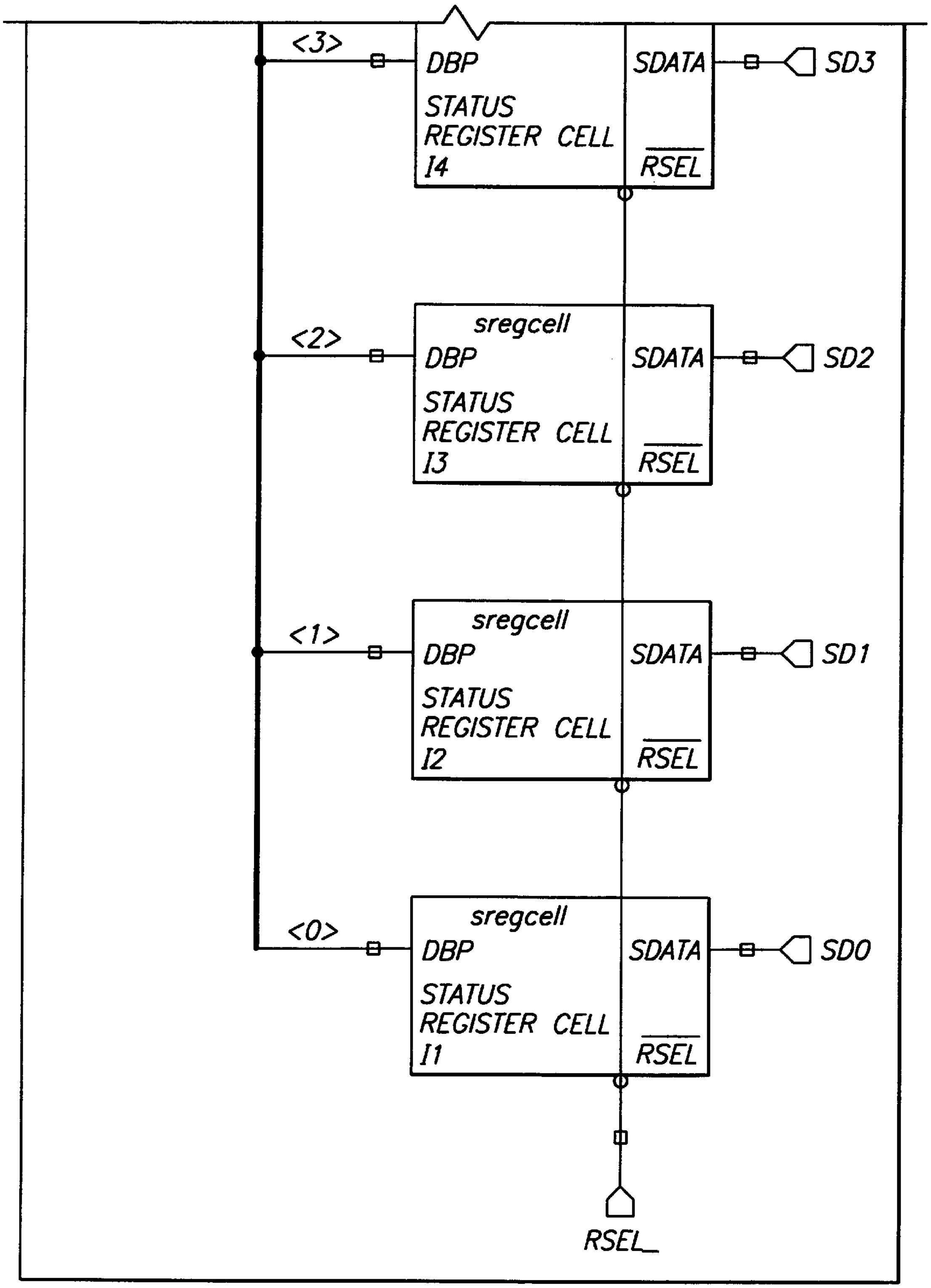
Fig 7.13BA

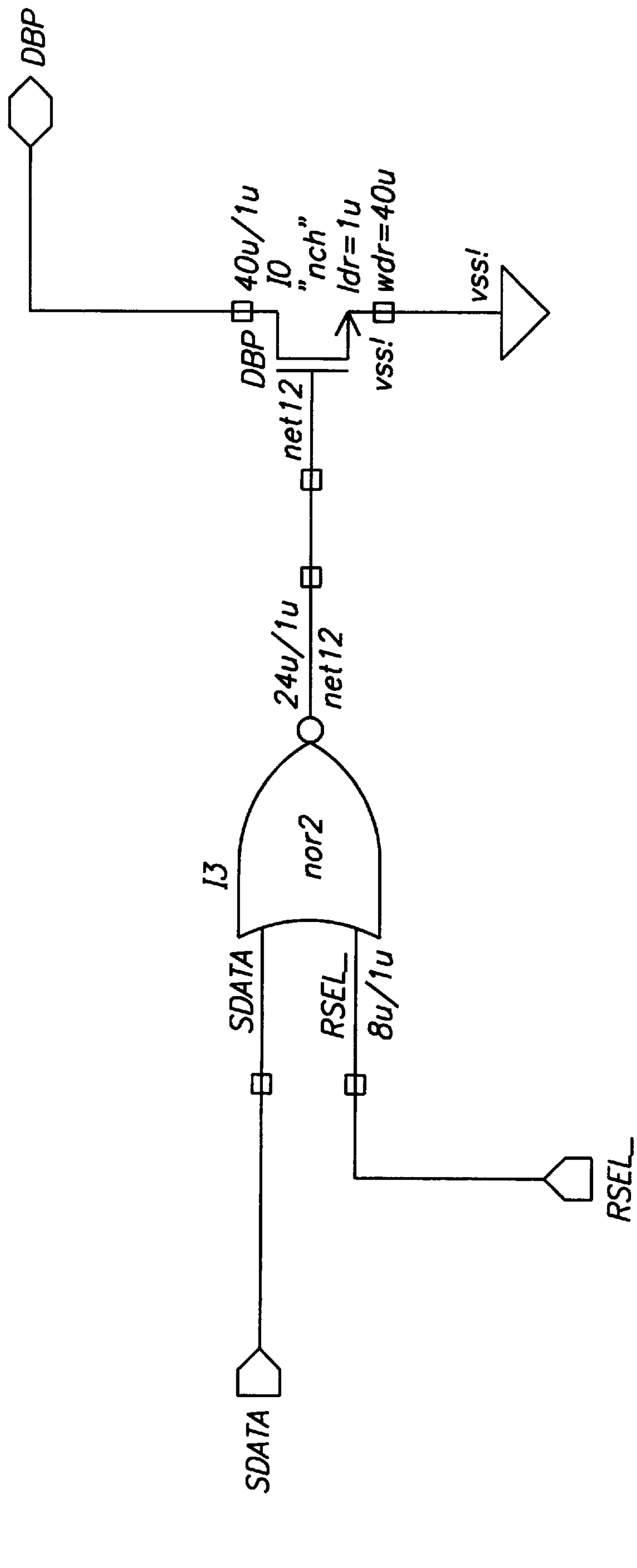
Fig. 7.1301

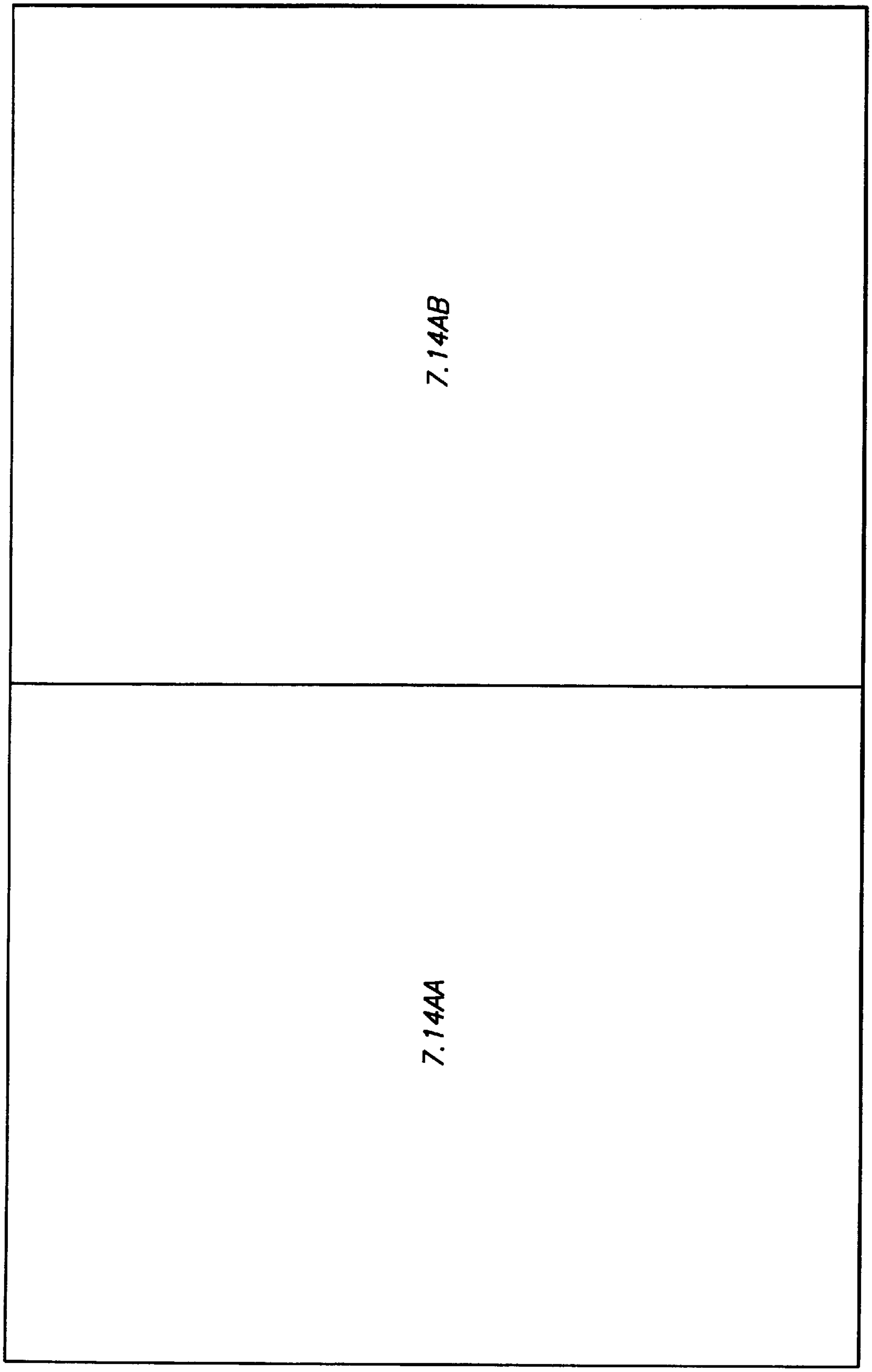
FIG. 7.14

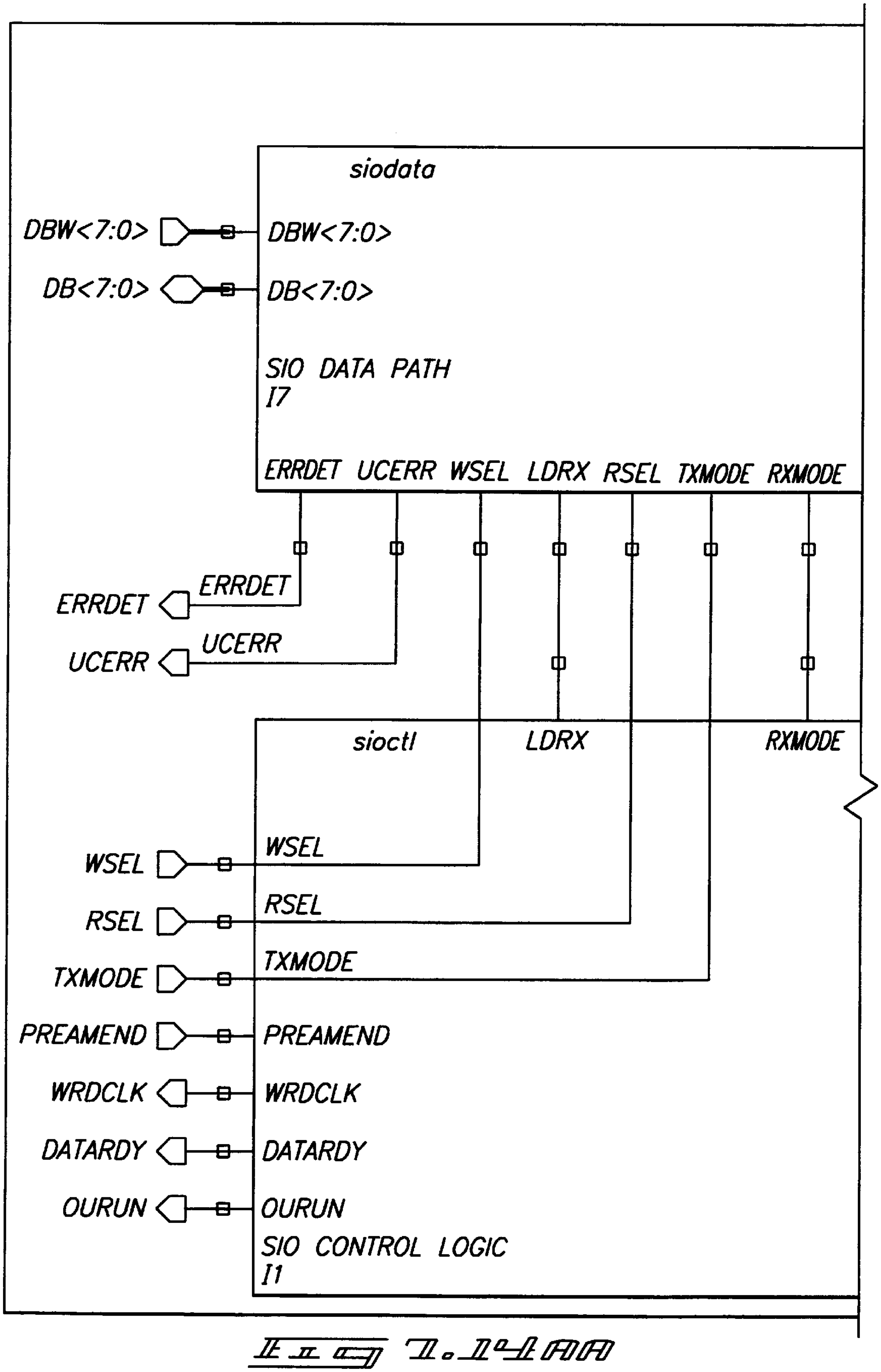
Fig. 1.14AA

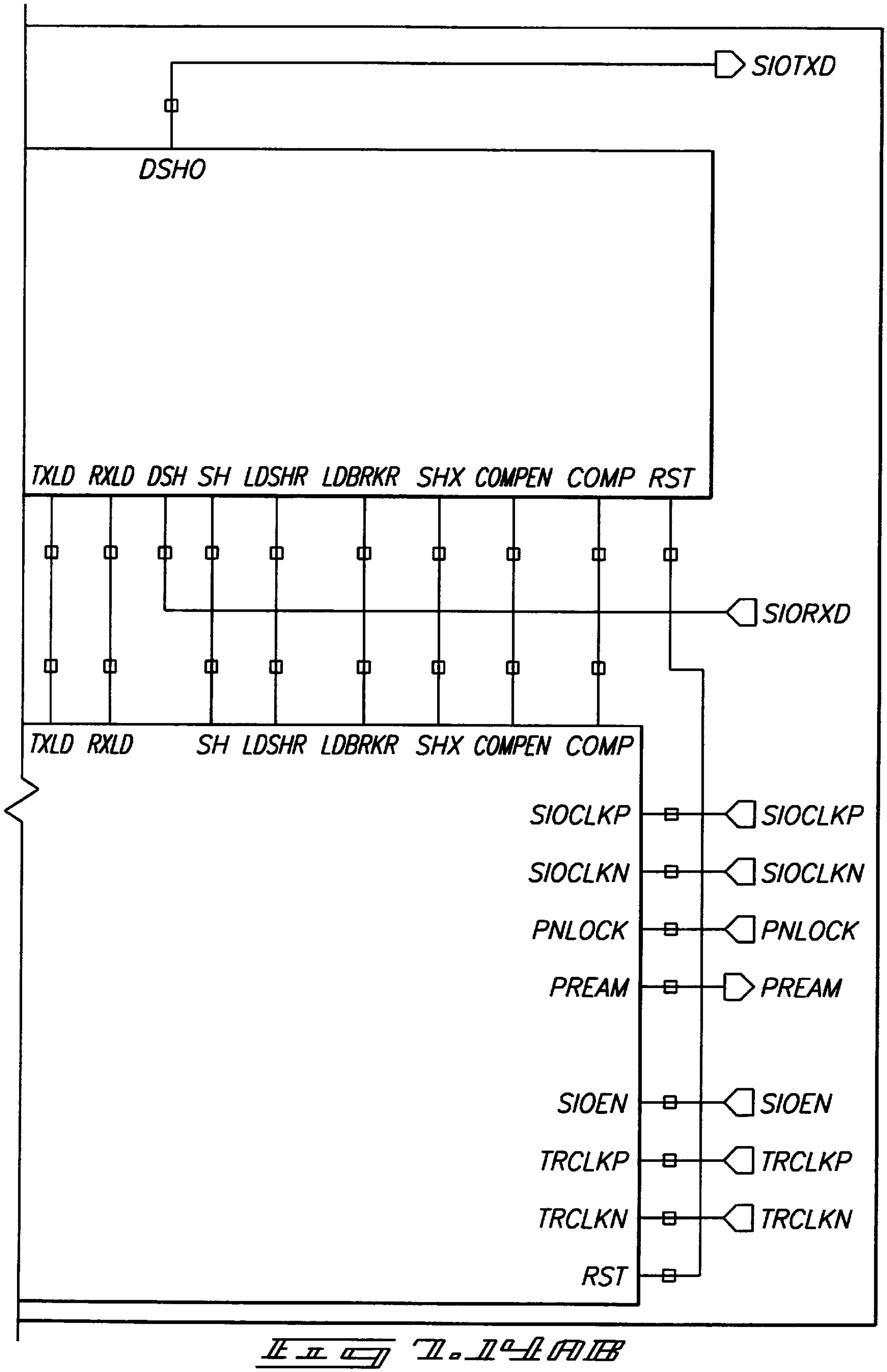
Fig. 7.14AB

| | | | | | |
|---|---|---|---|---|---|
| 7.1401AA | 7.1401AB | 7.1401AC | 7.1401AD | 7.1401AE | 7.1401AF |
| 7.1401BA | 7.1401BB | 7.1401BC | 7.1401BD | 7.1401BE | 7.1401BF |
| 7.1401CA | 7.1401CB | 7.1401CC | 7.1401CD | 7.1401CE | 7.1401CF |
| 7.1401DA | 7.1401DB | 7.1401DC | 7.1401DD | 7.1401DE | 7.1401DF |
| 7.1401EA | 7.1401EB | 7.1401EC | 7.1401ED | 7.1401EE | 7.1401EF |
| 7.1401FA | 7.1401FB | 7.1401FC | 7.1401FD | 7.1401FE | 7.1401FF |
| 7.1401GA | 7.1401GB | 7.1401GC | 7.1401GD | 7.1401GE | 7.1401GF |

Fig. 7.1401

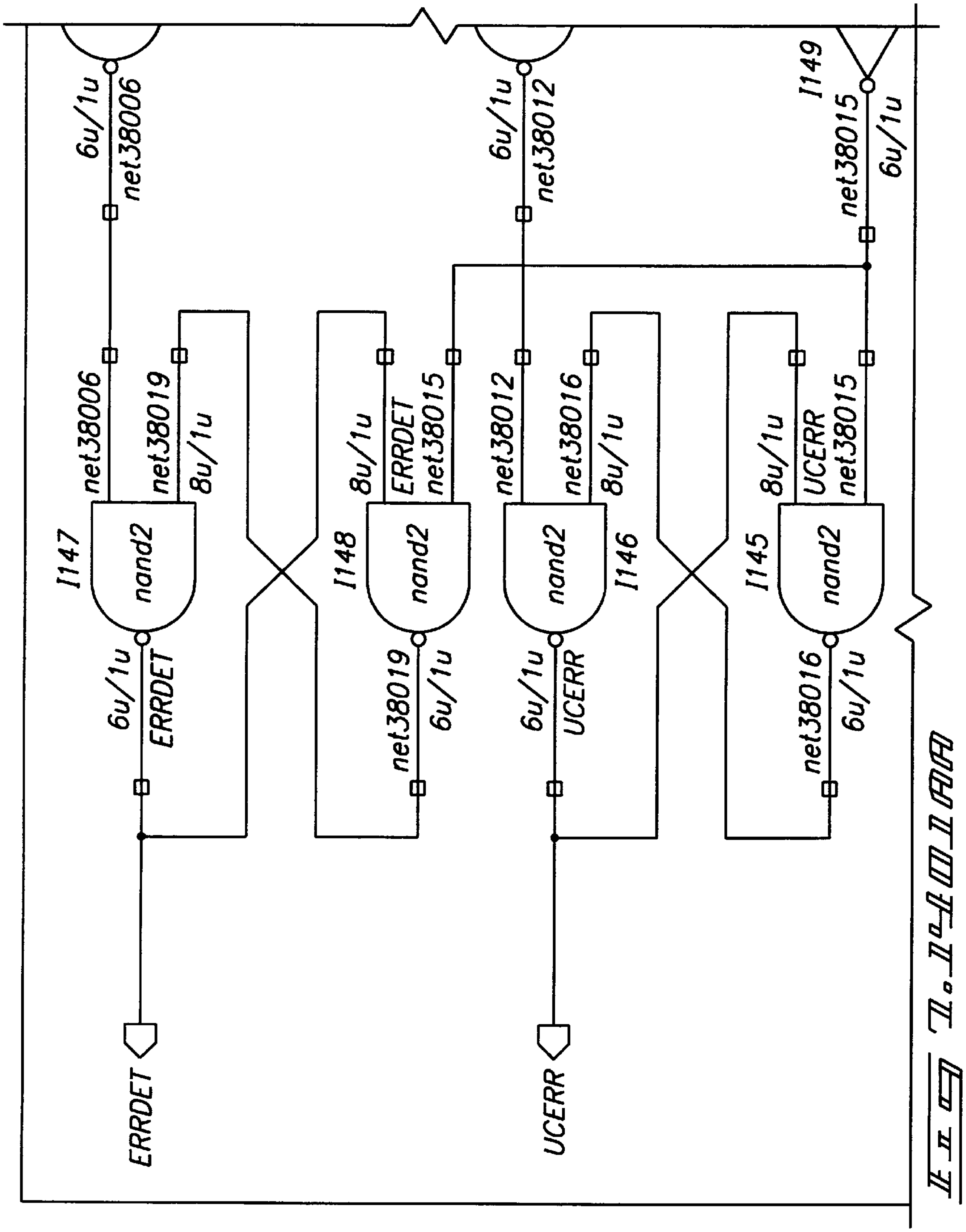
6u/1u
net38006
6u/1u
net38012
I149
net38015
6u/1u
net38006
net38019
8u/1u
8u/1u
ERRDET
net38015
net38012
net38016
8u/1u
8u/1u
UCERR
net38015
I147
nand2
I148
nand2
nand2
I146
I145
nand2
6u/1u
ERRDET
net38019
6u/1u
6u/1u
UCERR
net38016
6u/1u
ERRDET
UCERR

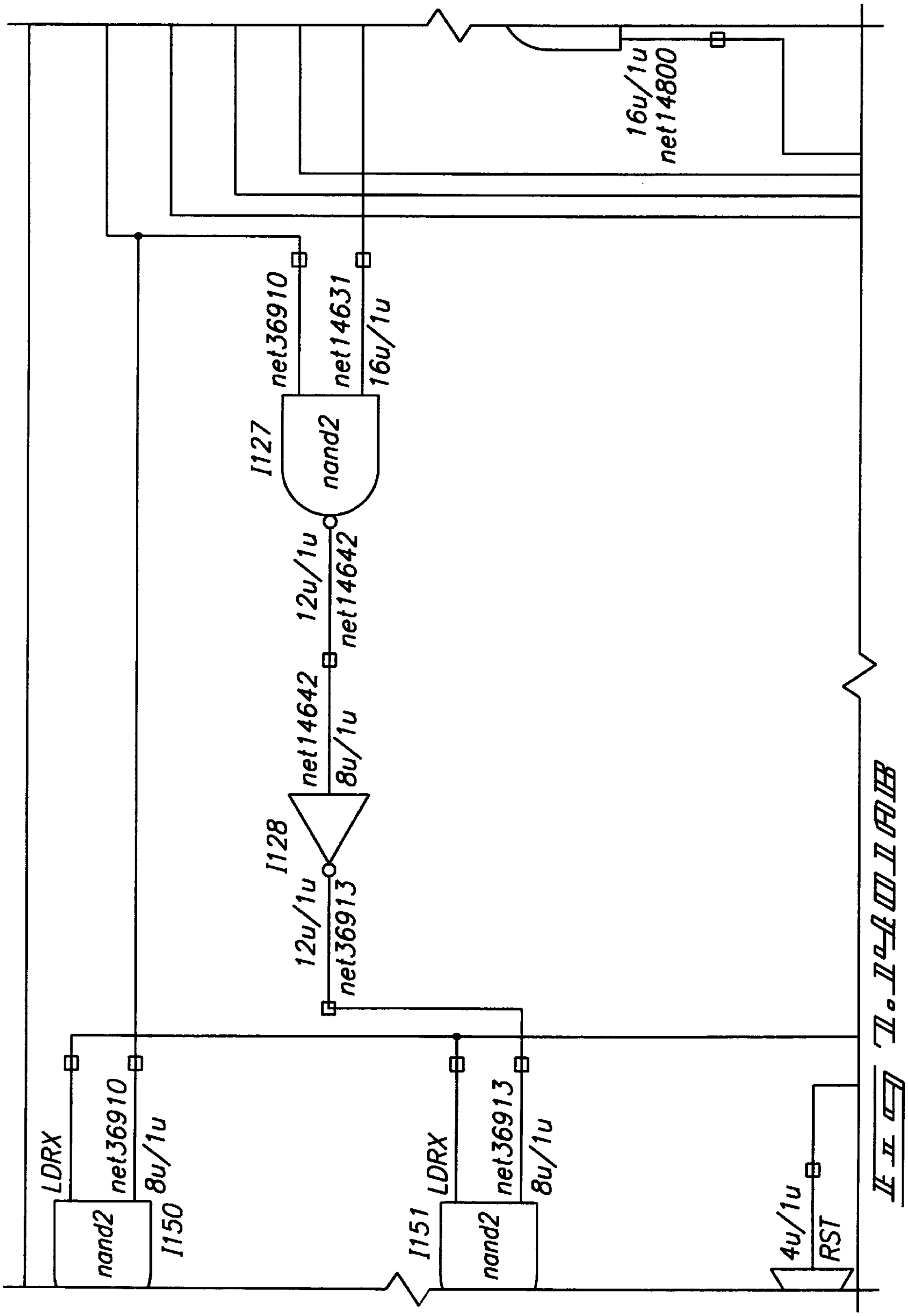
16u/1u
net14800
net36910
net14631
16u/1u
I127
nand2
12u/1u
net14642
net14642
8u/1u
I128
12u/1u
net36913
LDRX
net36910
8u/1u
nand2
I150
I151
LDRX
net36913
8u/1u
nand2
4u/1u
RST

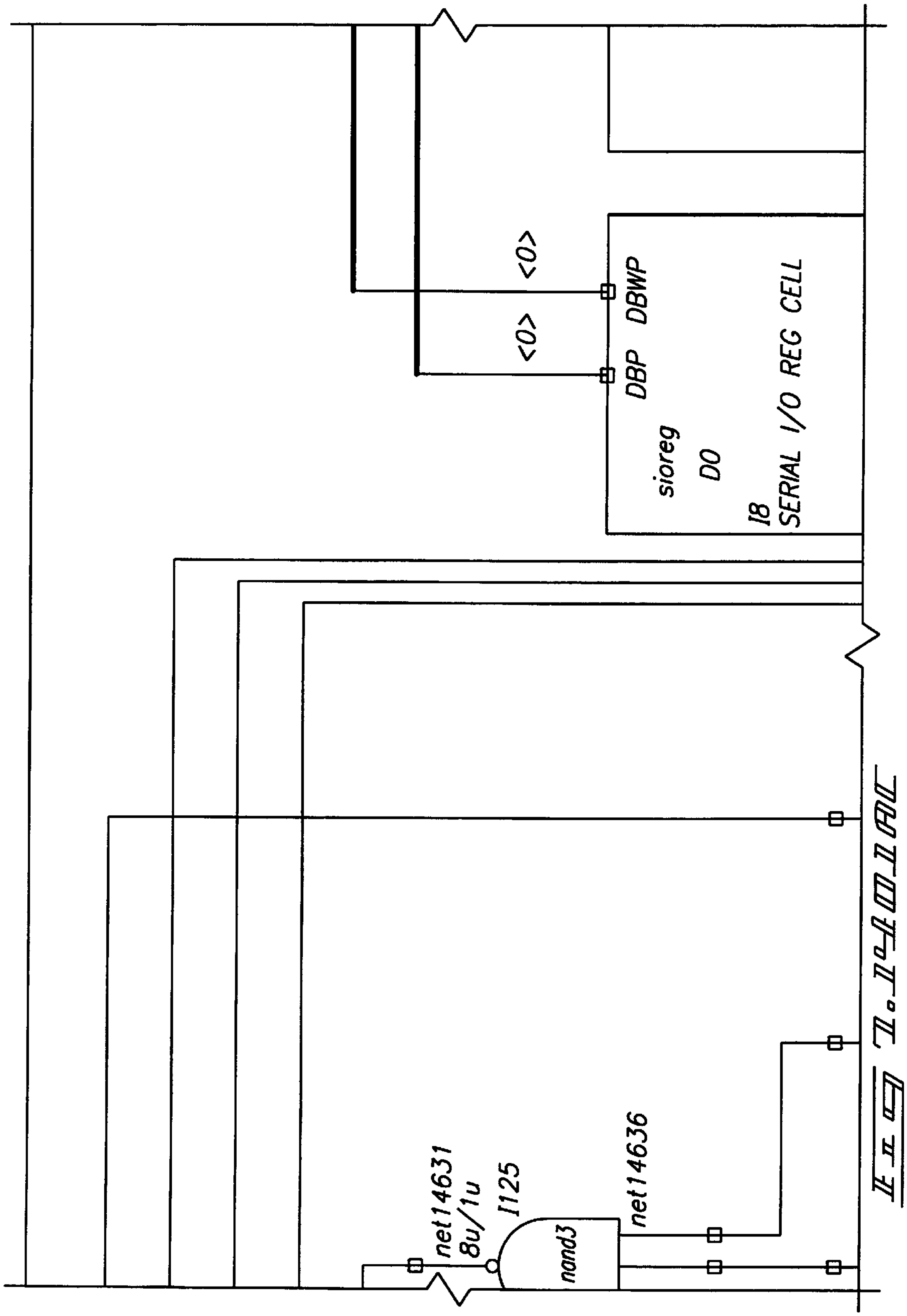
FIG. 7.1401AL

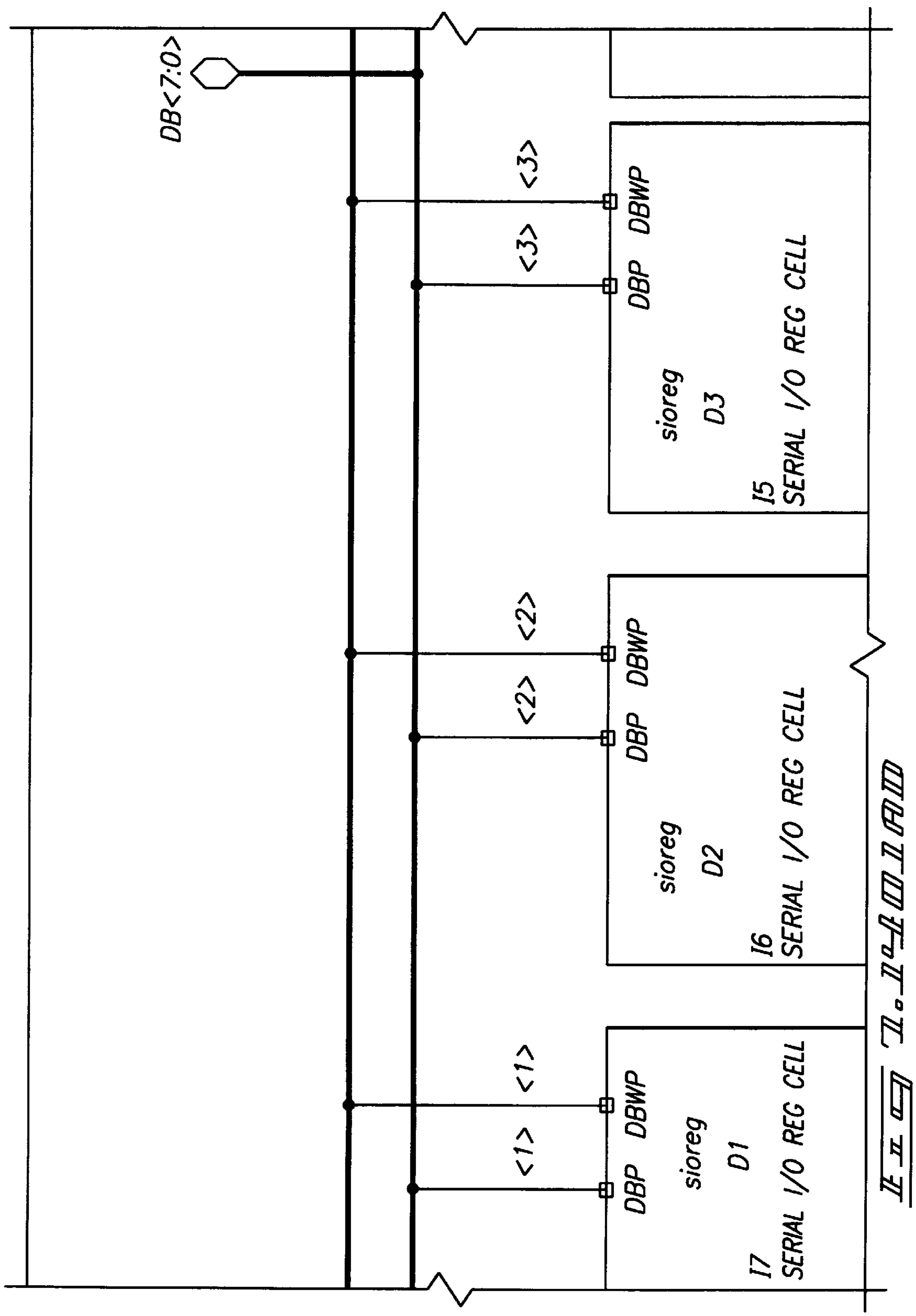
DB<7:0>
<3>
<3>
DBP DBWP
sioreg
D3
I5
SERIAL I/O REG CELL
<2>
<2>
DBP DBWP
sioreg
D2
I6
SERIAL I/O REG CELL
<1>
<1>
DBP DBWP
sioreg
D1
I7
SERIAL I/O REG CELL

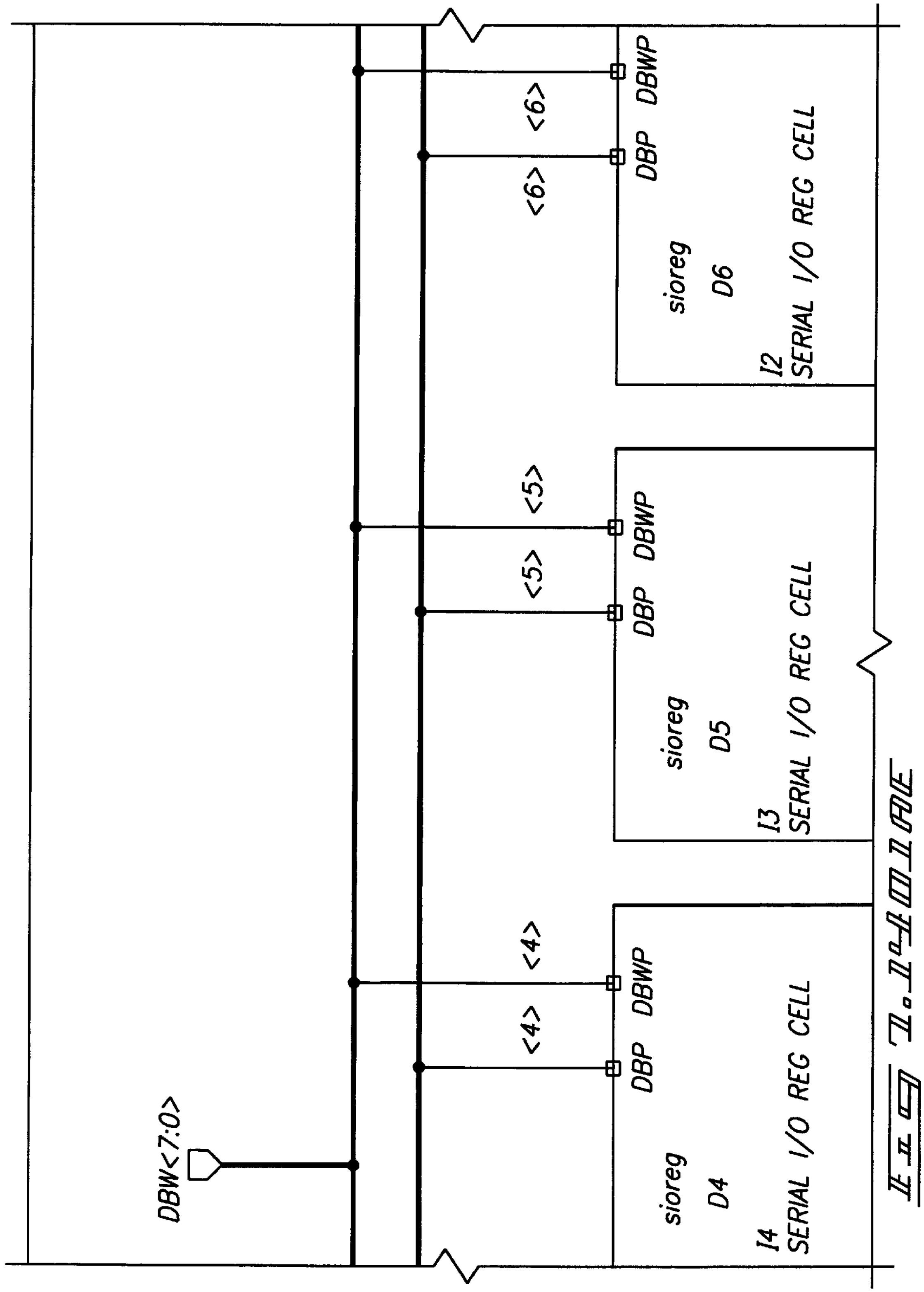
FIG. 7.1401AE

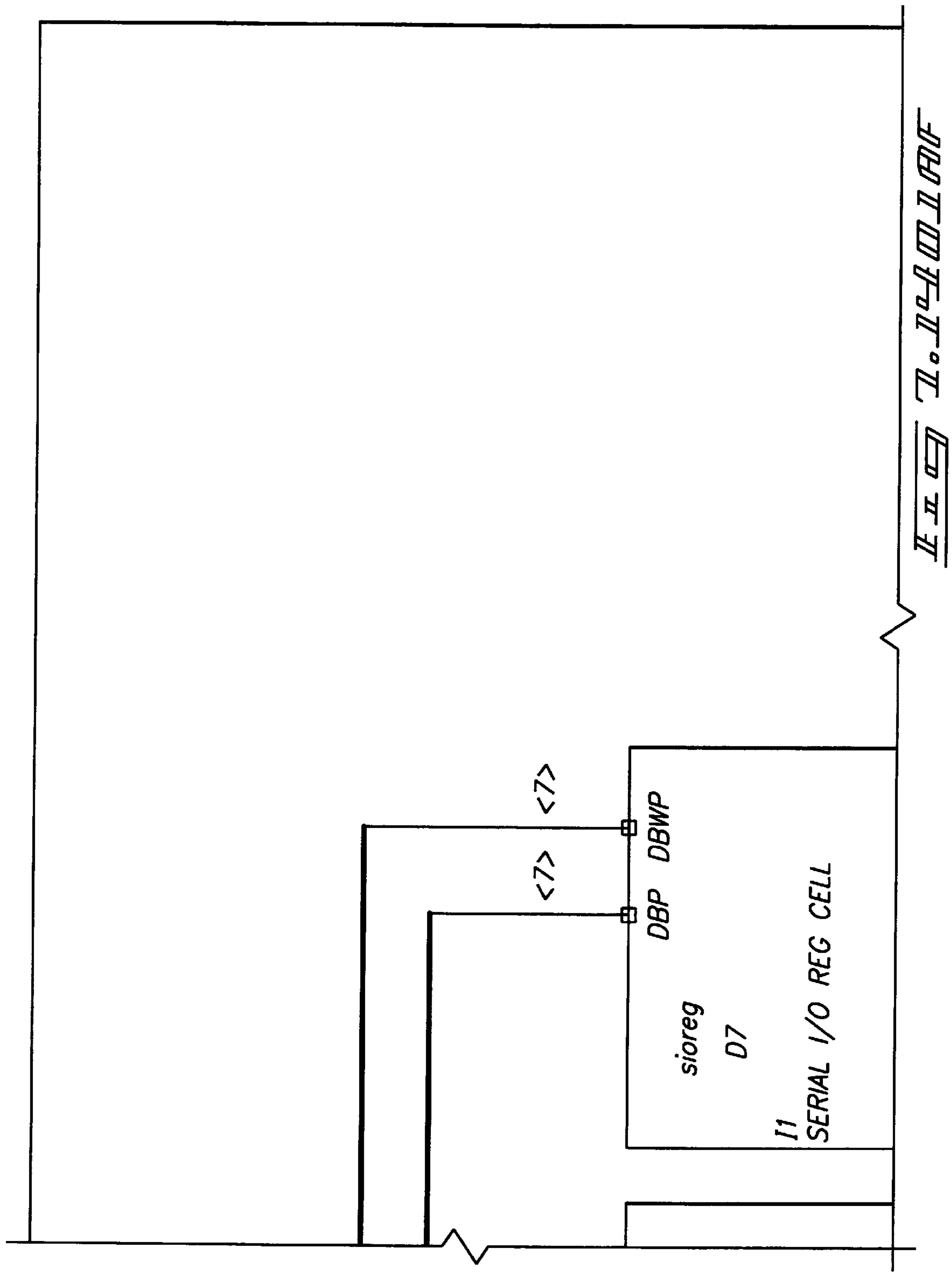
<7>
<7>
DBP
DBWP
sioreg
D7
I1
SERIAL I/O REG CELL

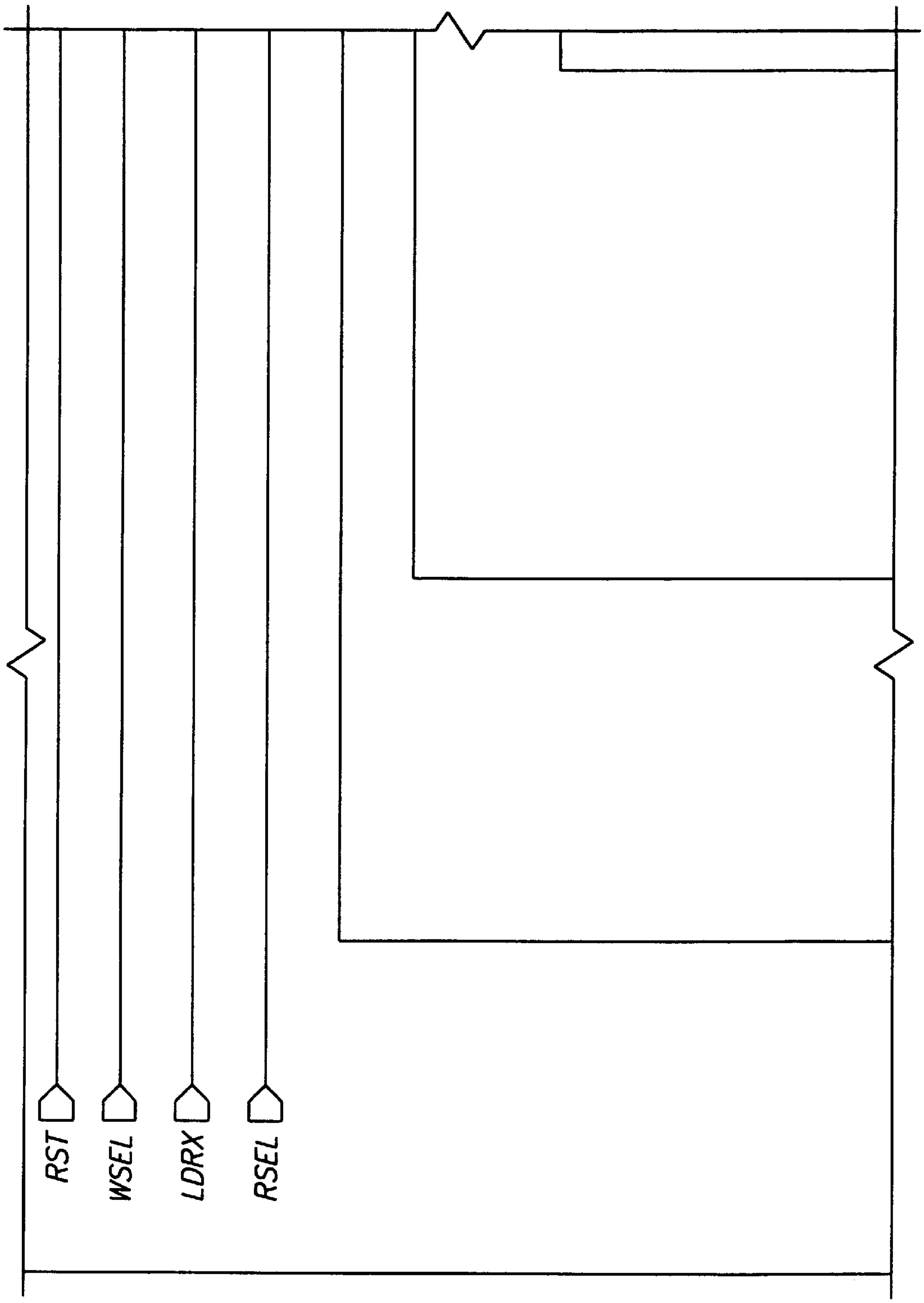
FIG. 7.1401BA

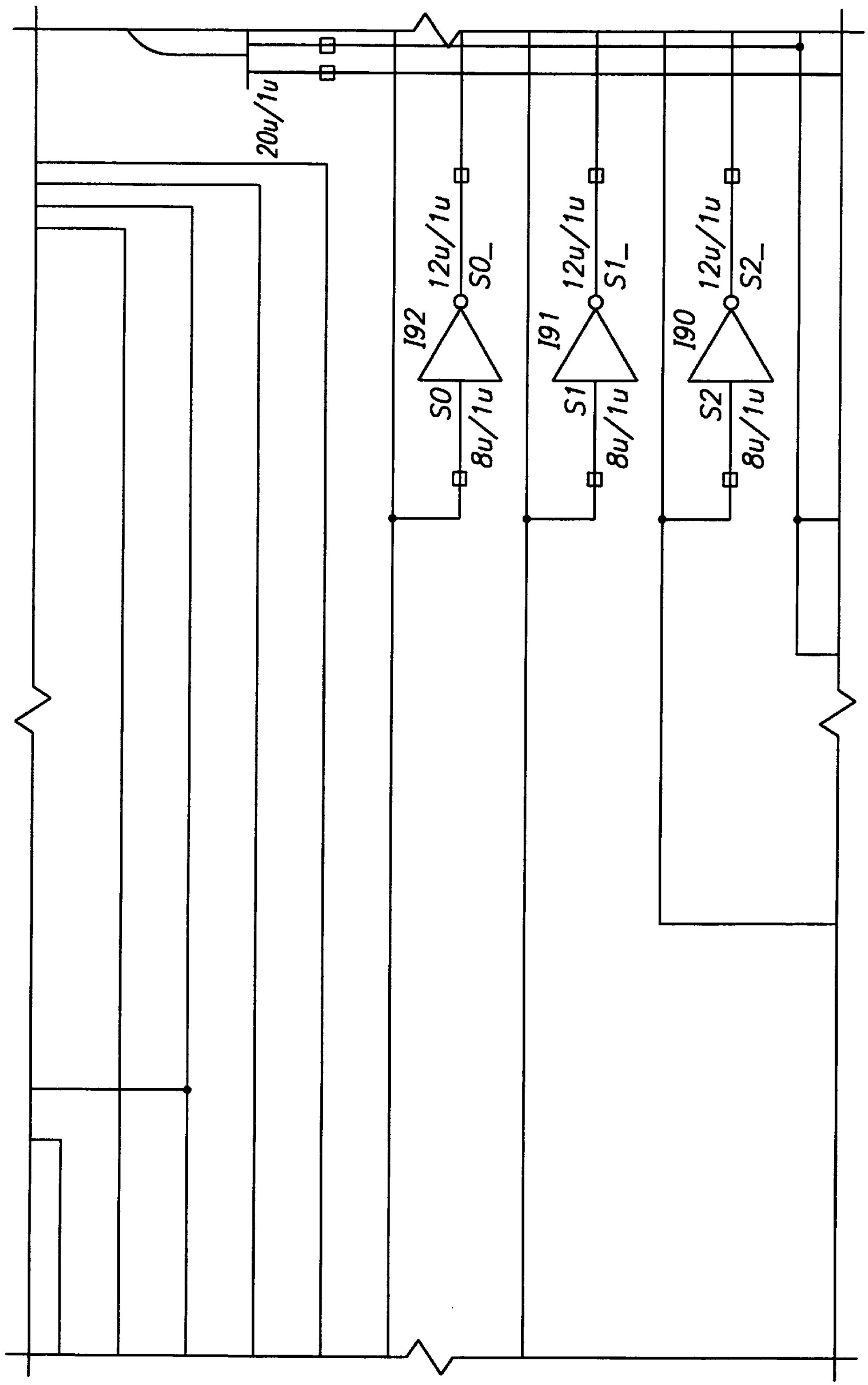
FIG. 7.10.1BB

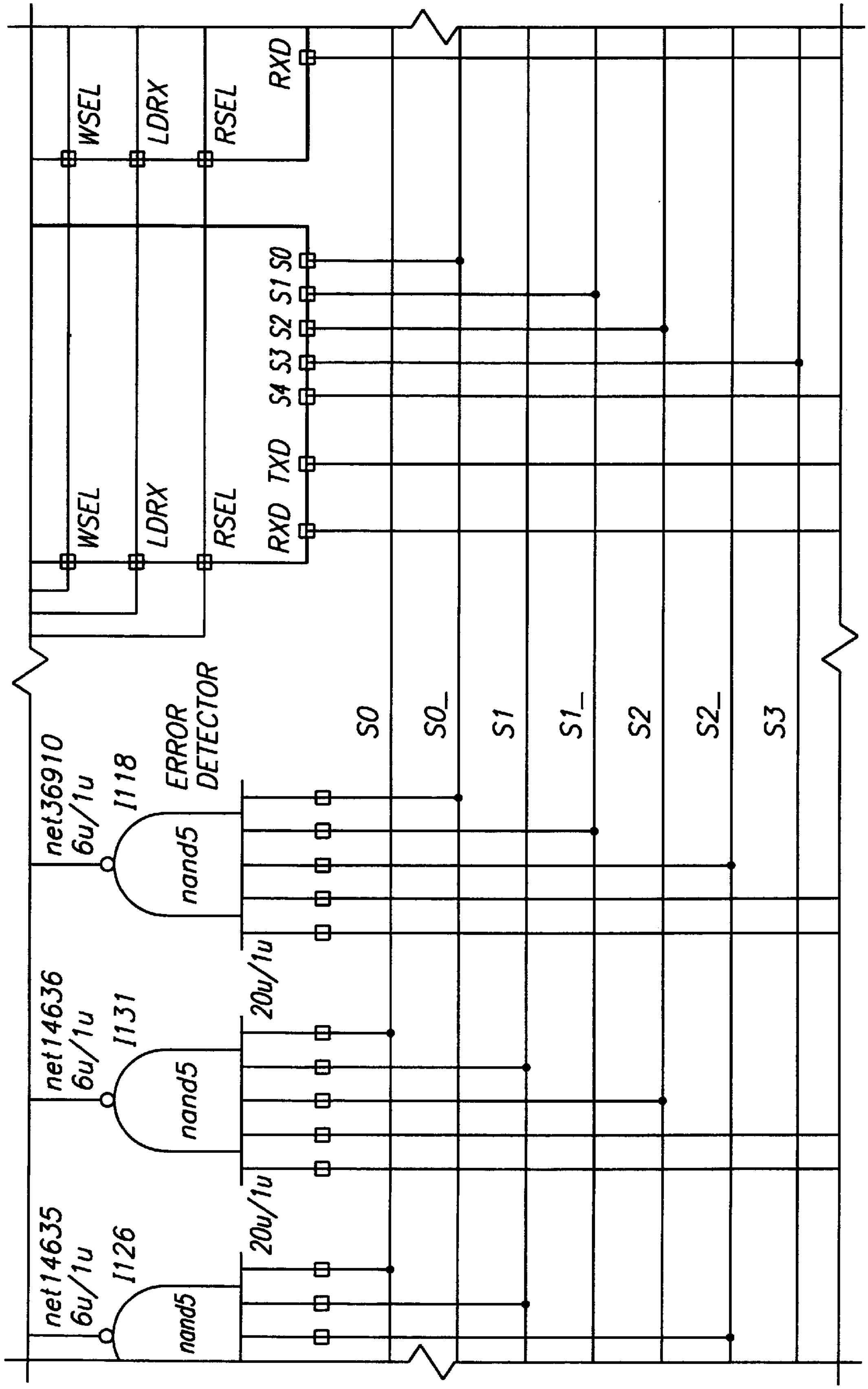
Fig. 14011BC

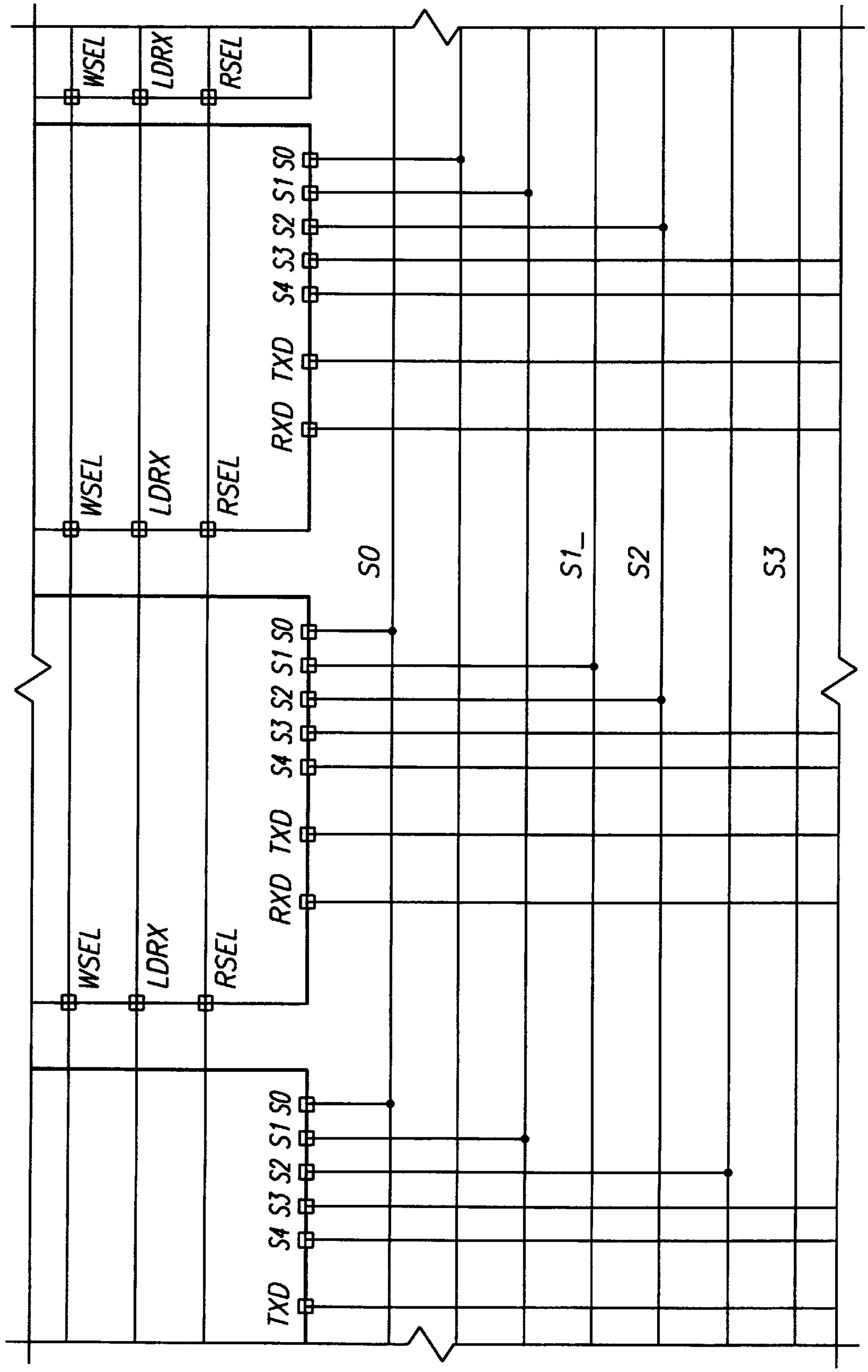
WSEL
LDRX
RSEL
S0
S1
S2
S3
S4
TXD
RXD
S1_

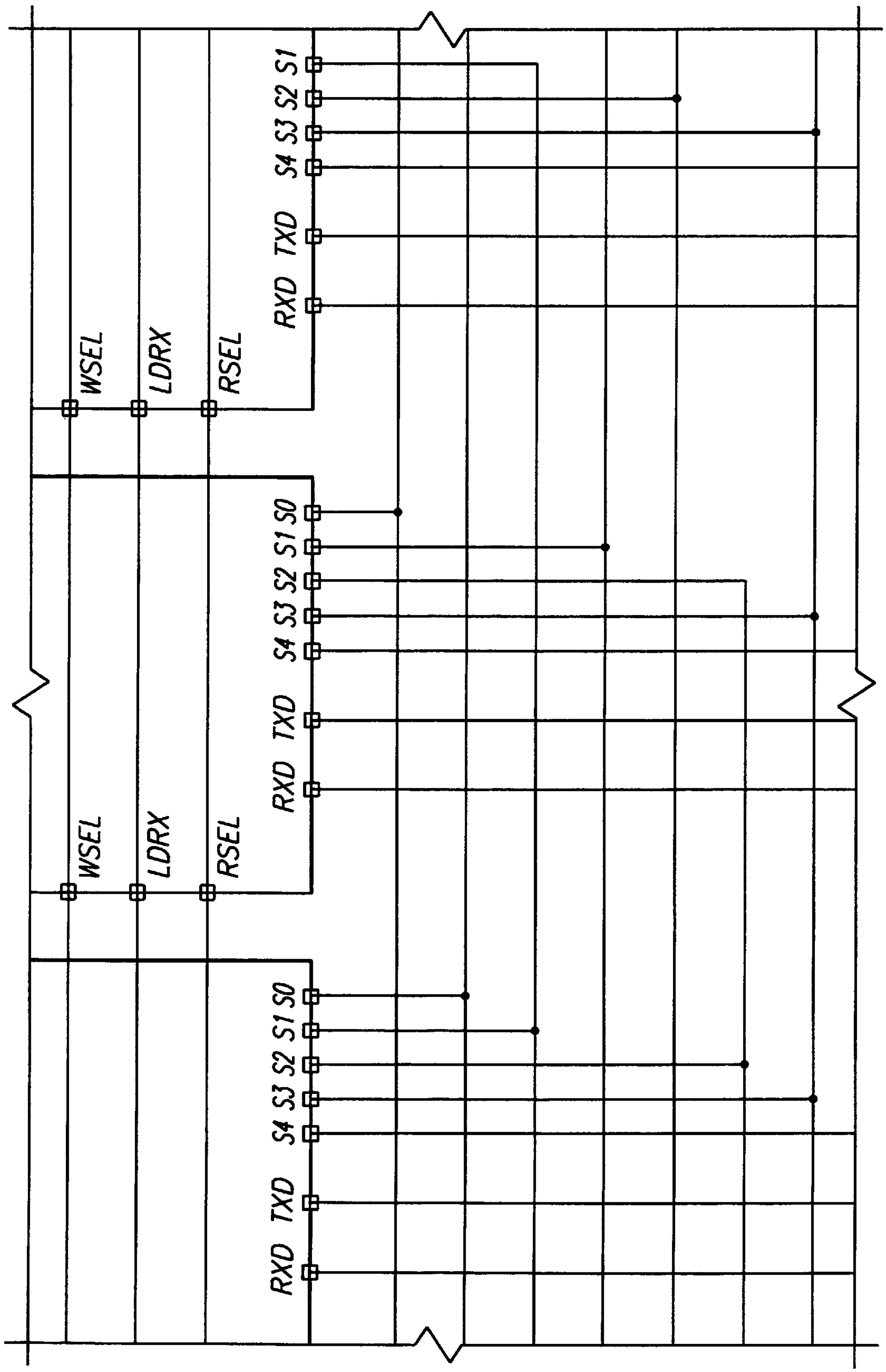
FIG. 7.740BE

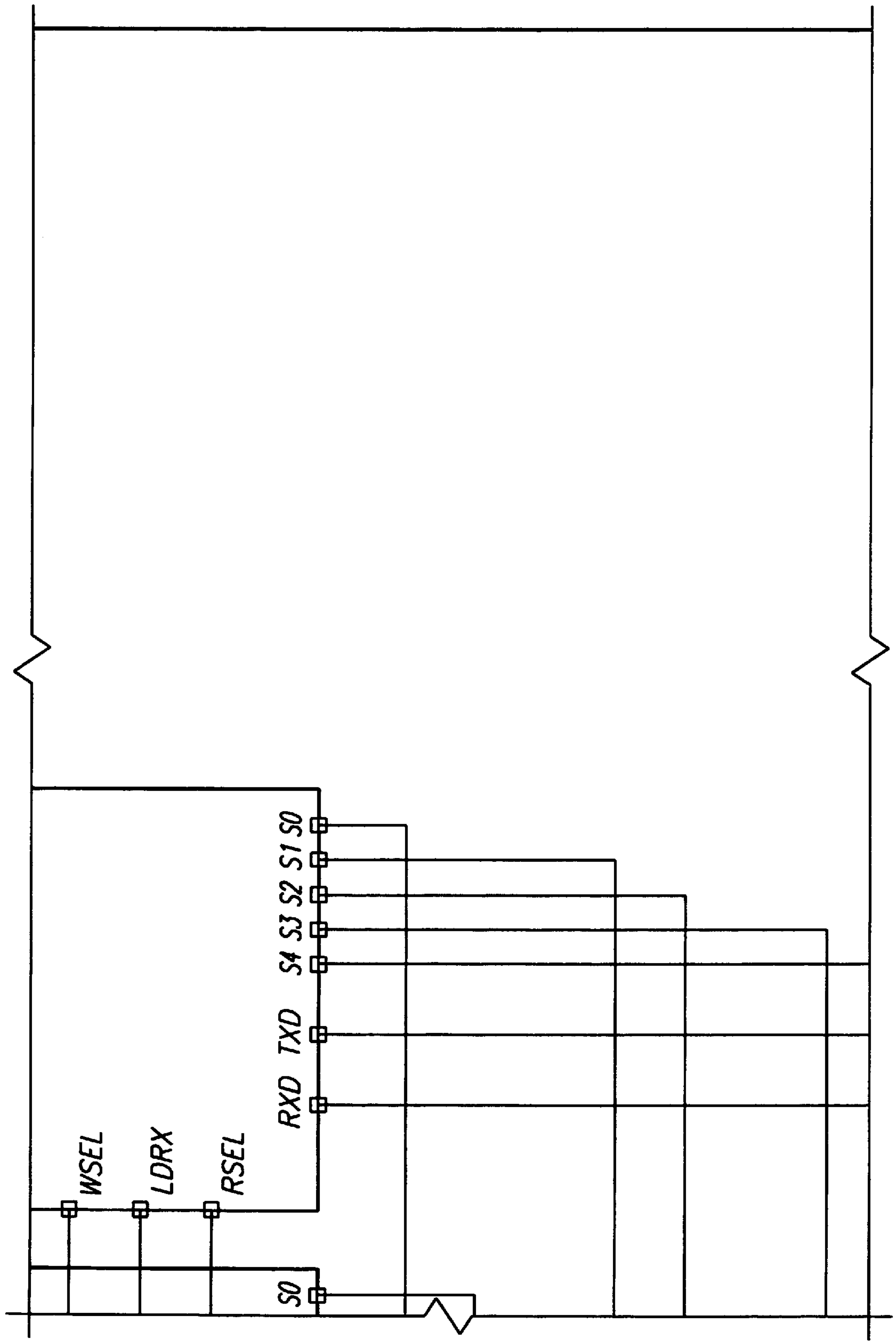
FIG. 71.401BF

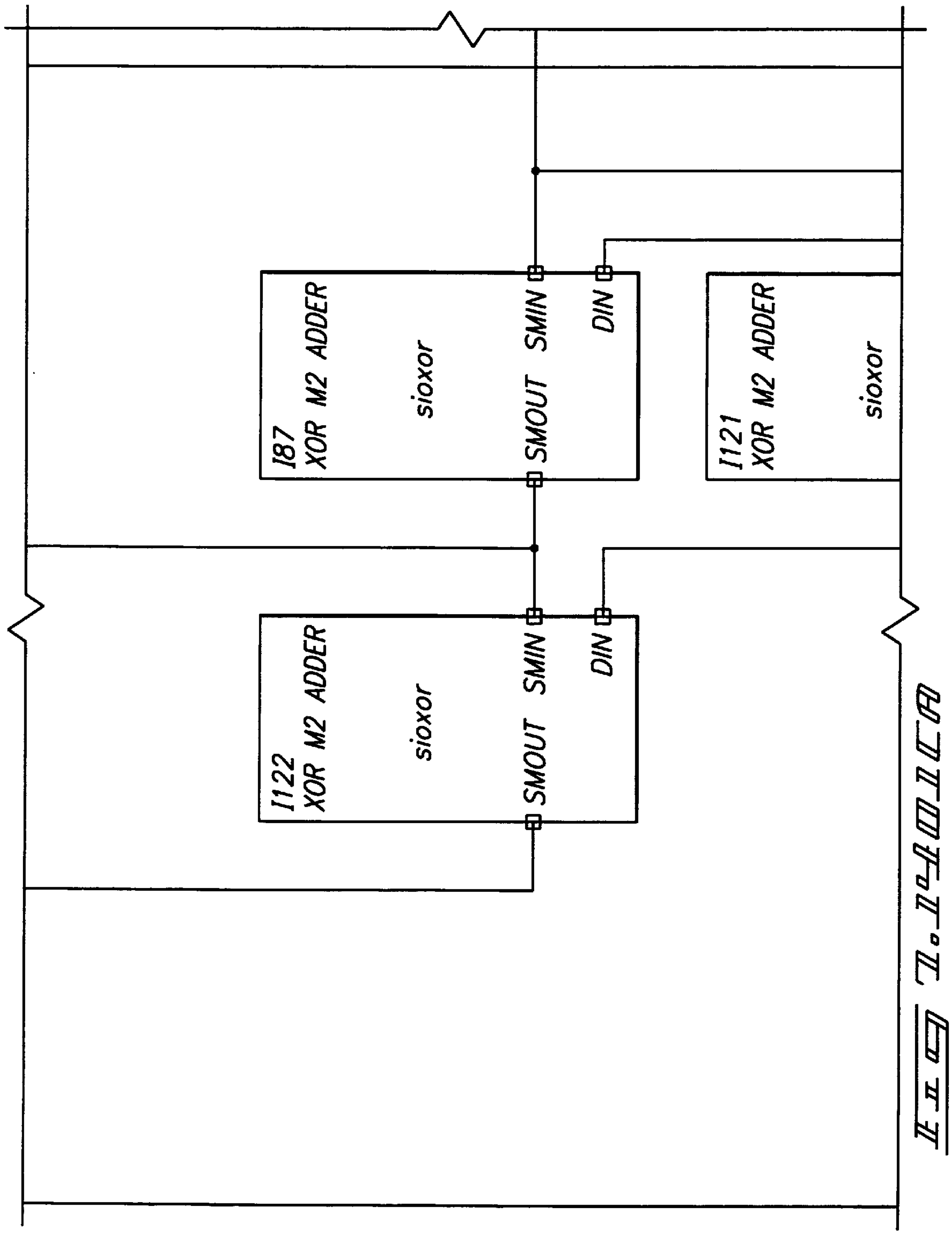
FIG. 7.1401CA

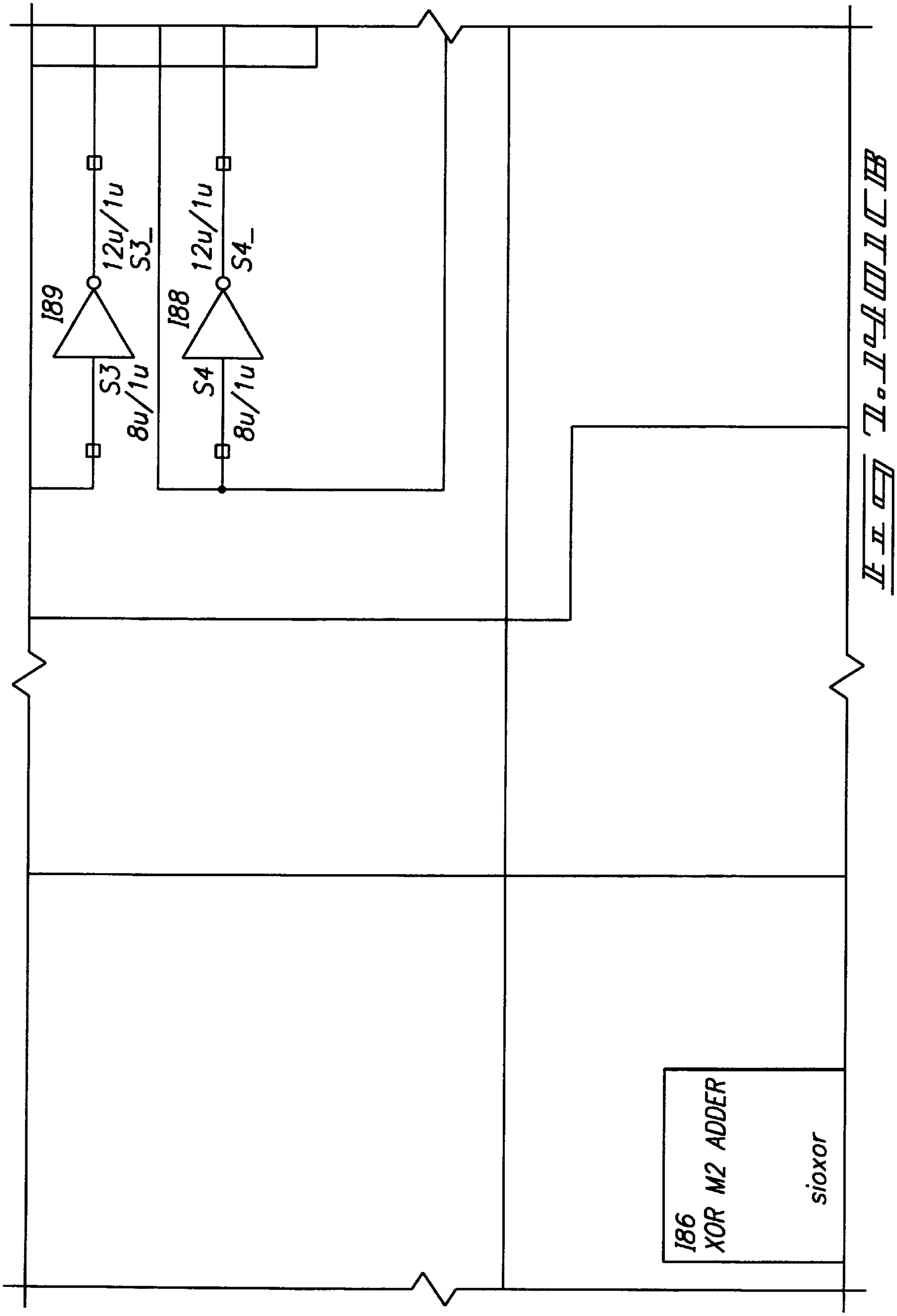
FIG. 7.140ICB

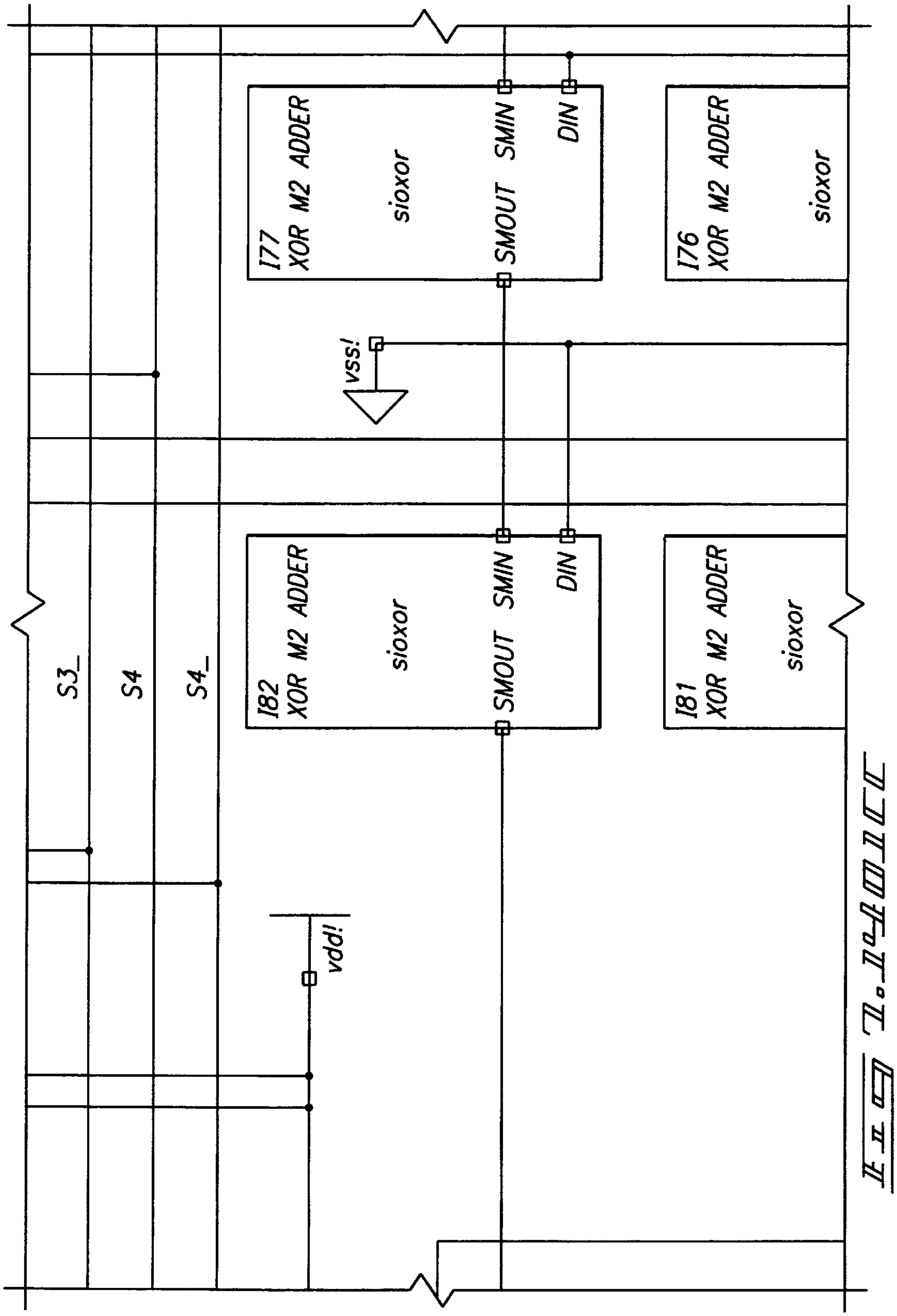
I77
XOR M2 ADDER
sioxor
SMOUT
SMIN
DIN
I76
XOR M2 ADDER
sioxor
vss!
I82
XOR M2 ADDER
sioxor
SMOUT
SMIN
DIN
I81
XOR M2 ADDER
sioxor
S3_
S4
S4_
vdd!

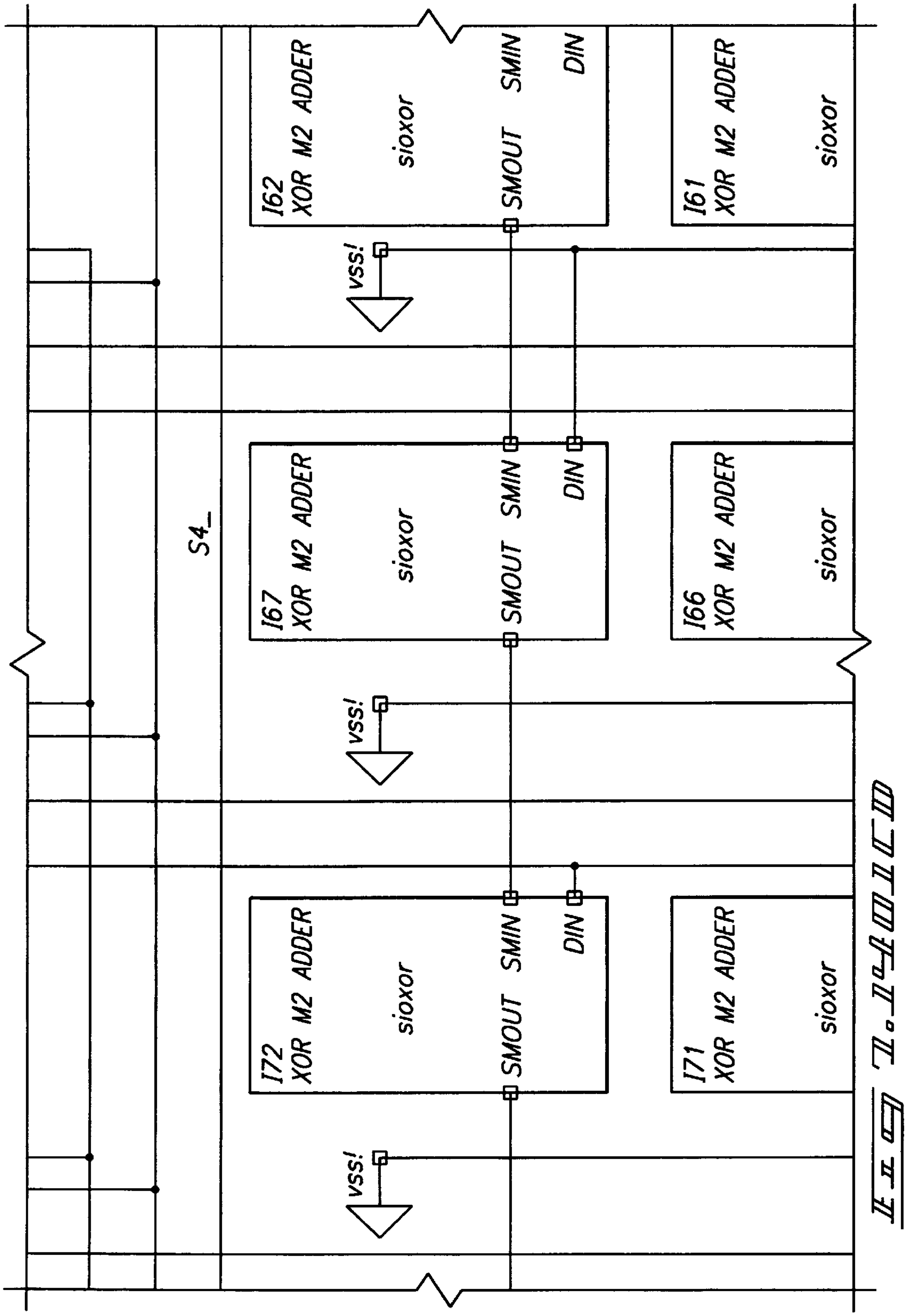
FIG. 7.14D1CD

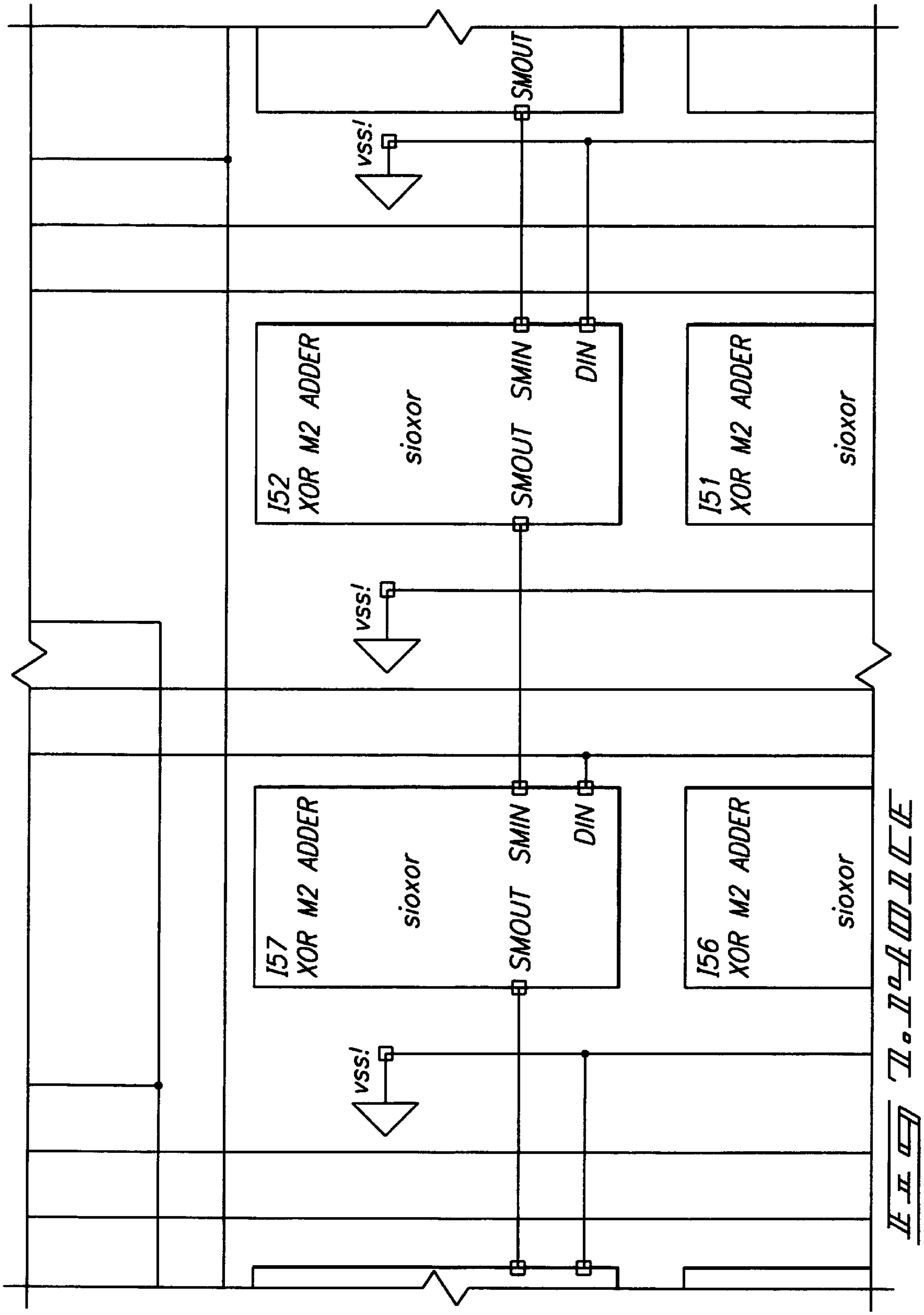
FIG. 7.14OICE

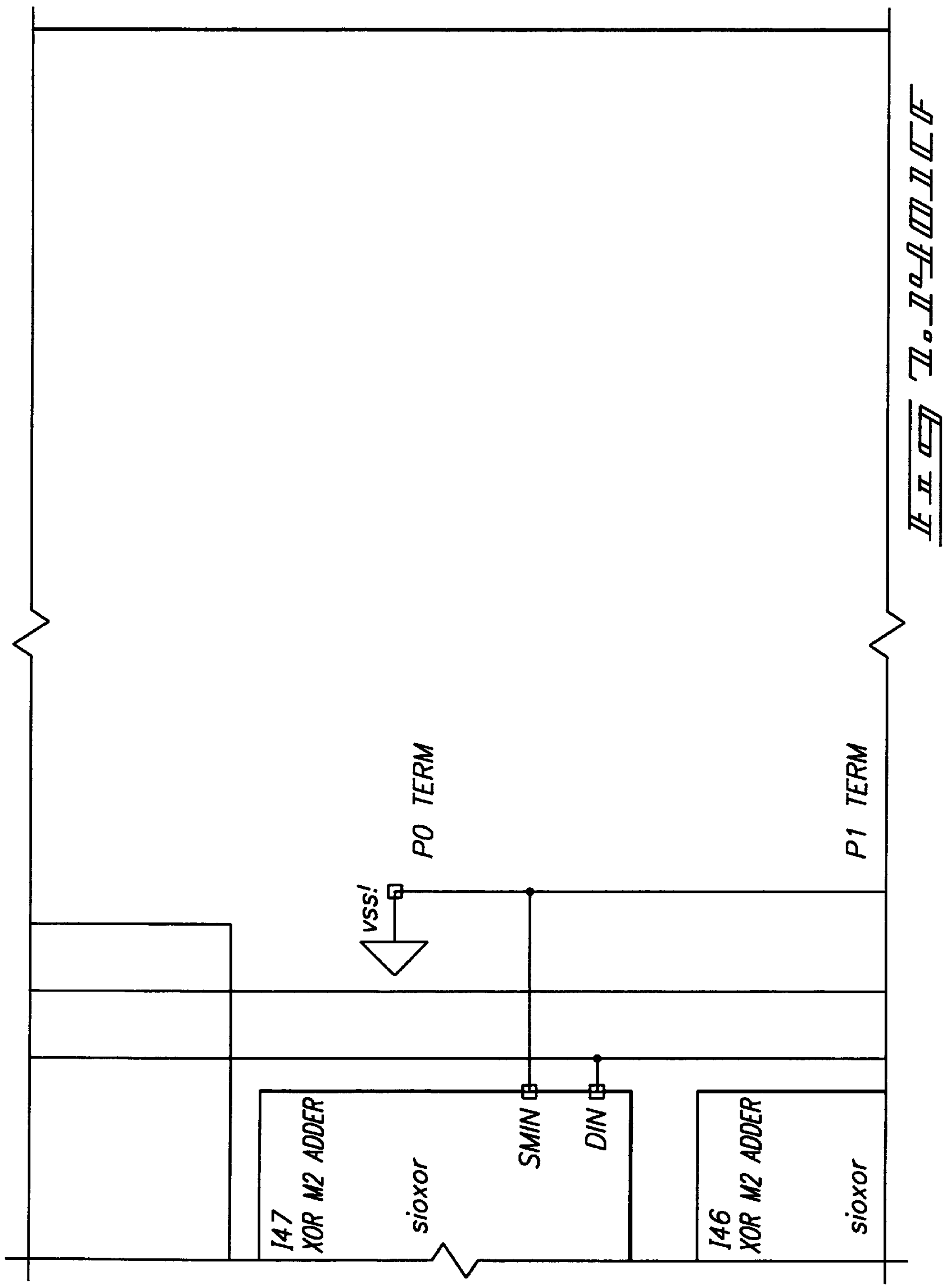
Fig. 7.11.4011CF

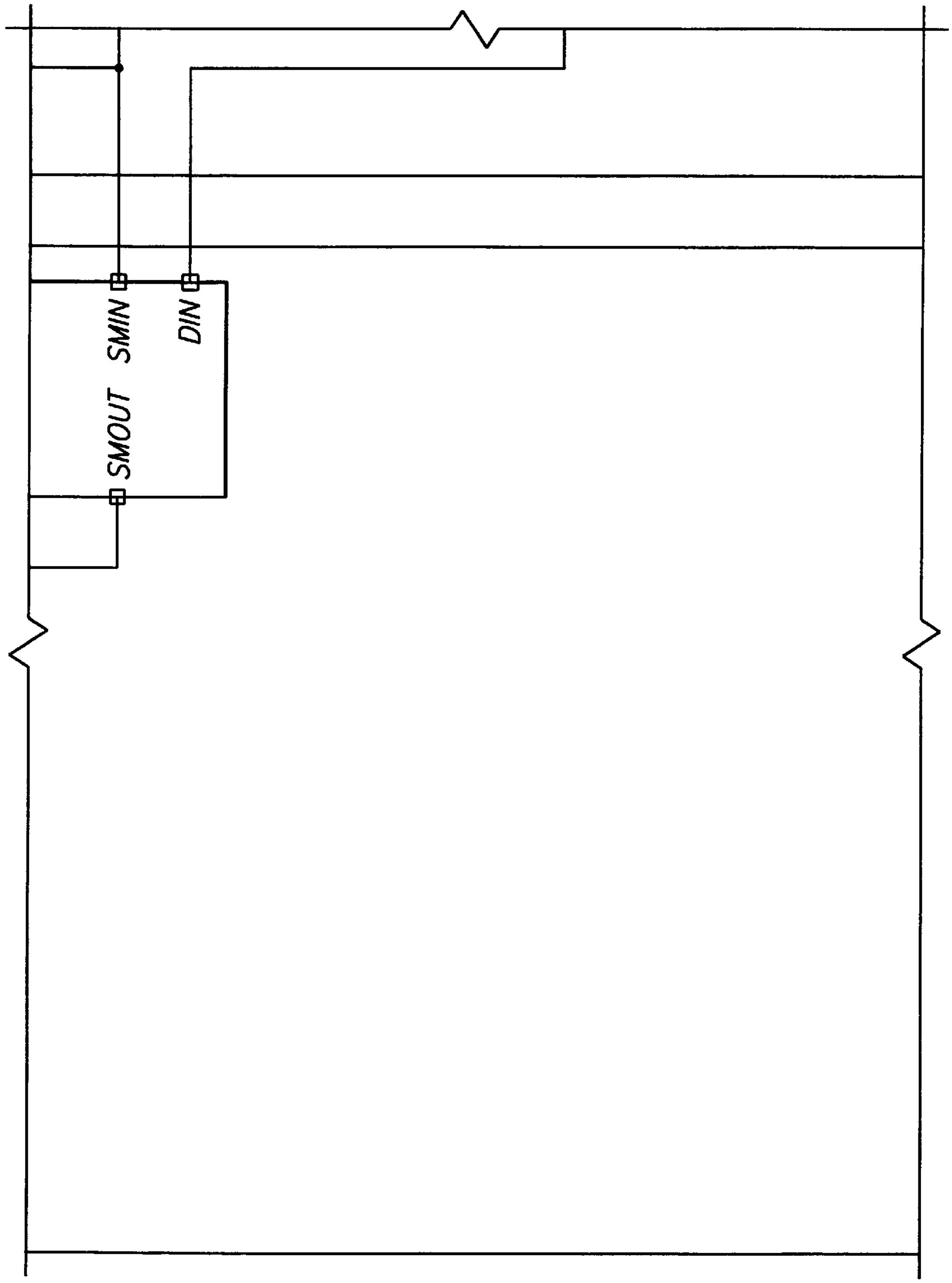
FIG. 7.14010A

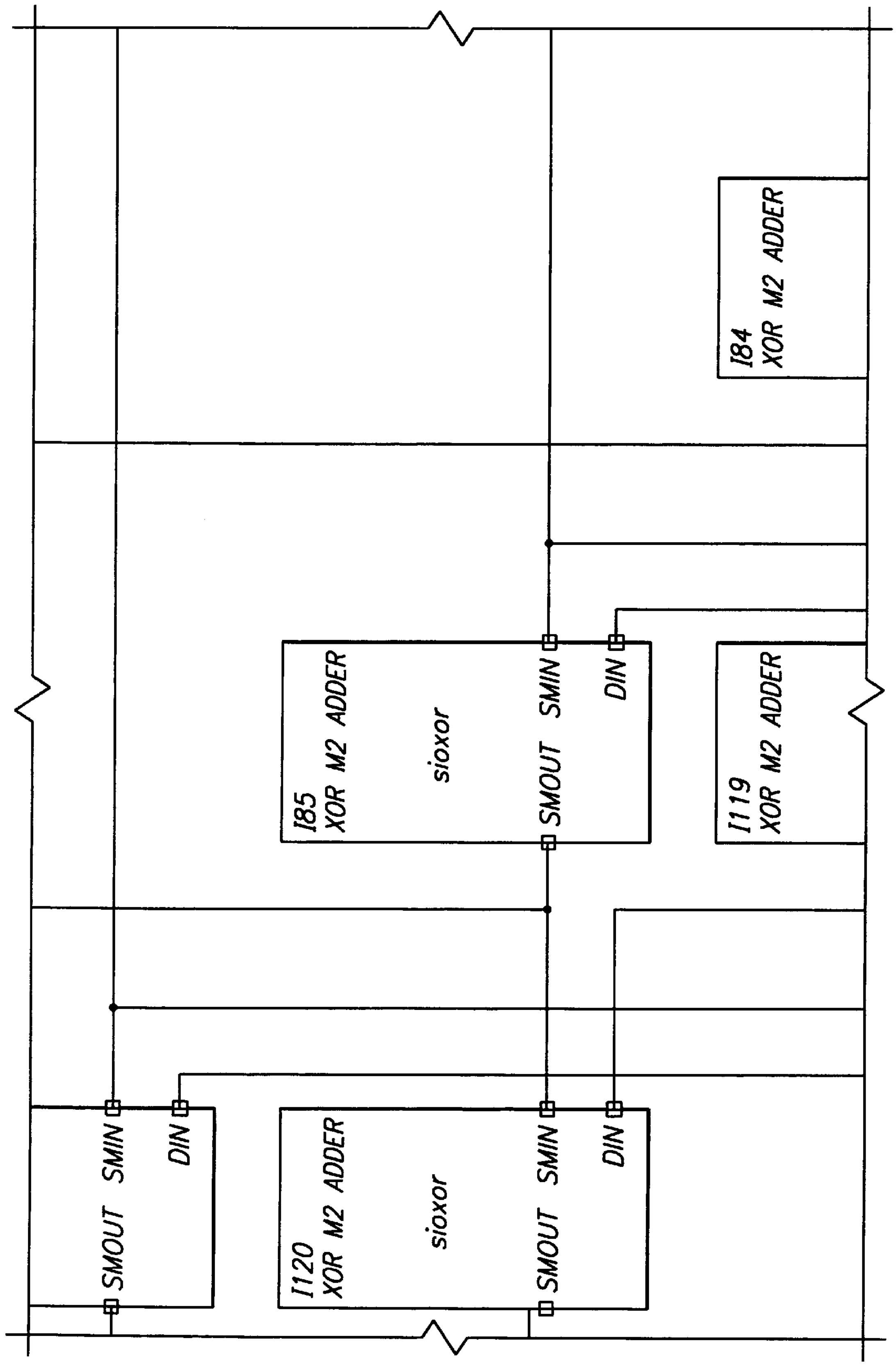
Fig. 7.14D1DB

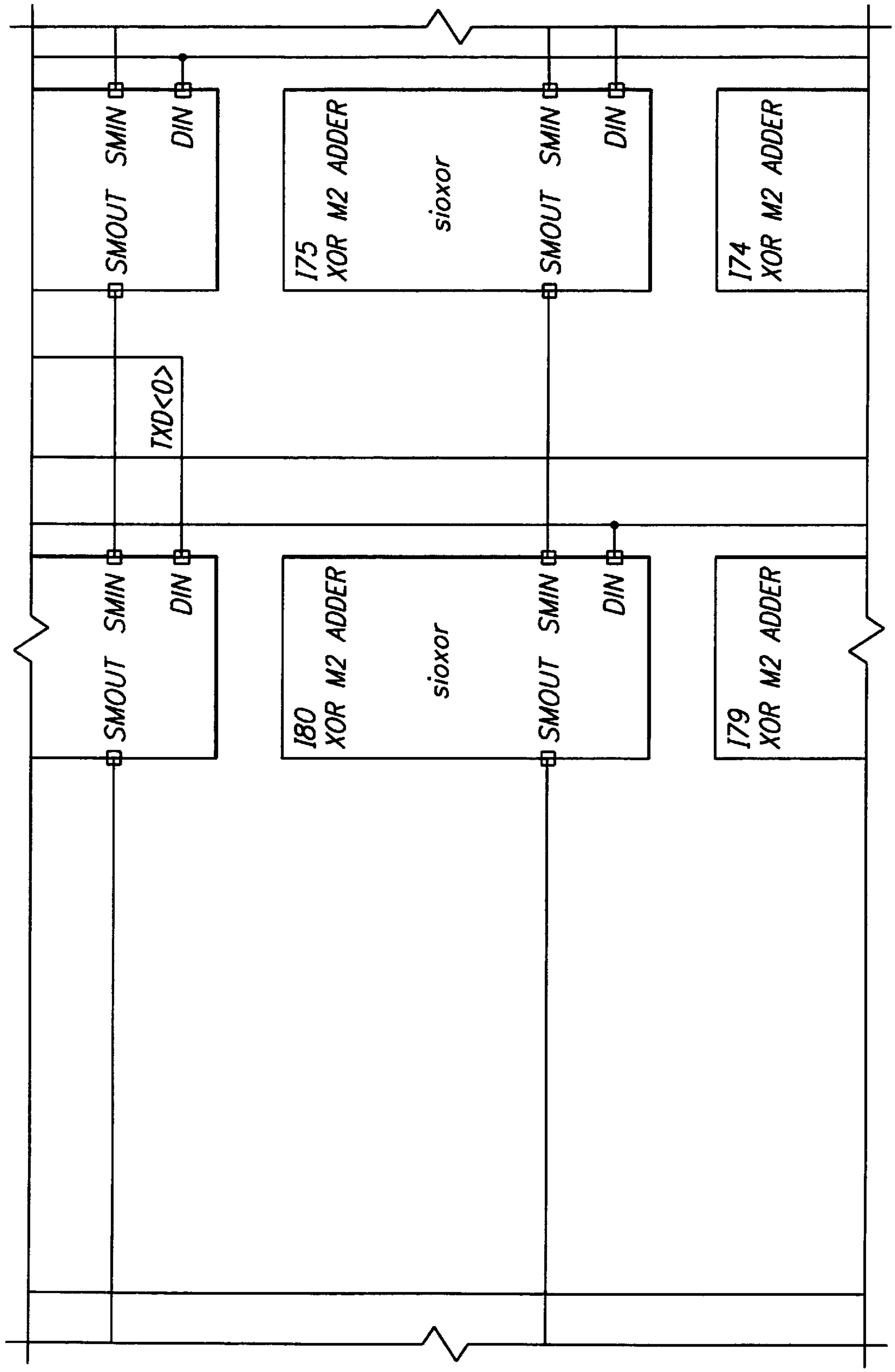
FIG. 7.10DC

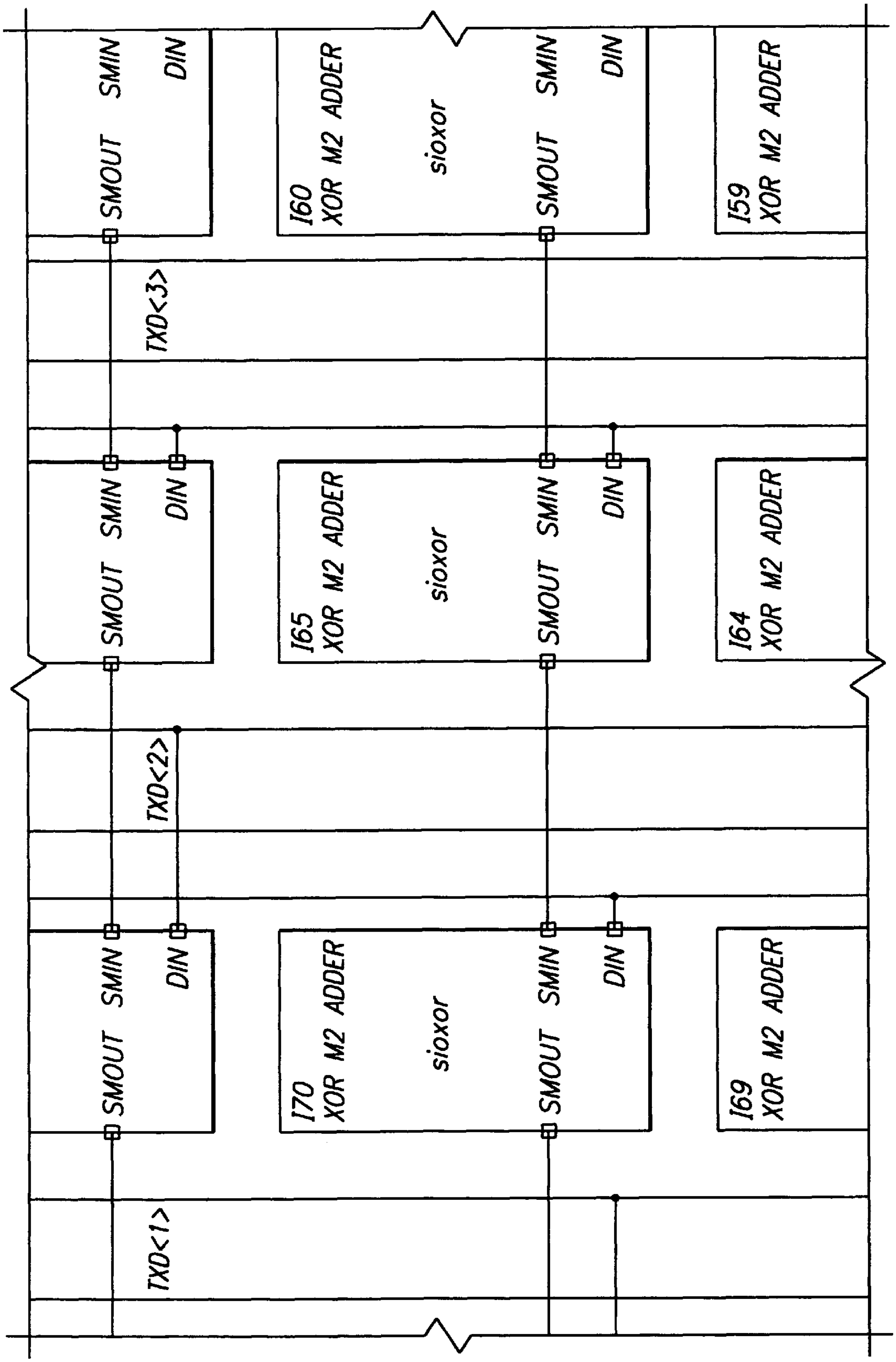
SMOUT SMIN
DIN
I60
XOR M2 ADDER
sioxor
I59
XOR M2 ADDER
TXD<3>
I65
XOR M2 ADDER
I64
TXD<2>
I70
XOR M2 ADDER
I69
TXD<1>

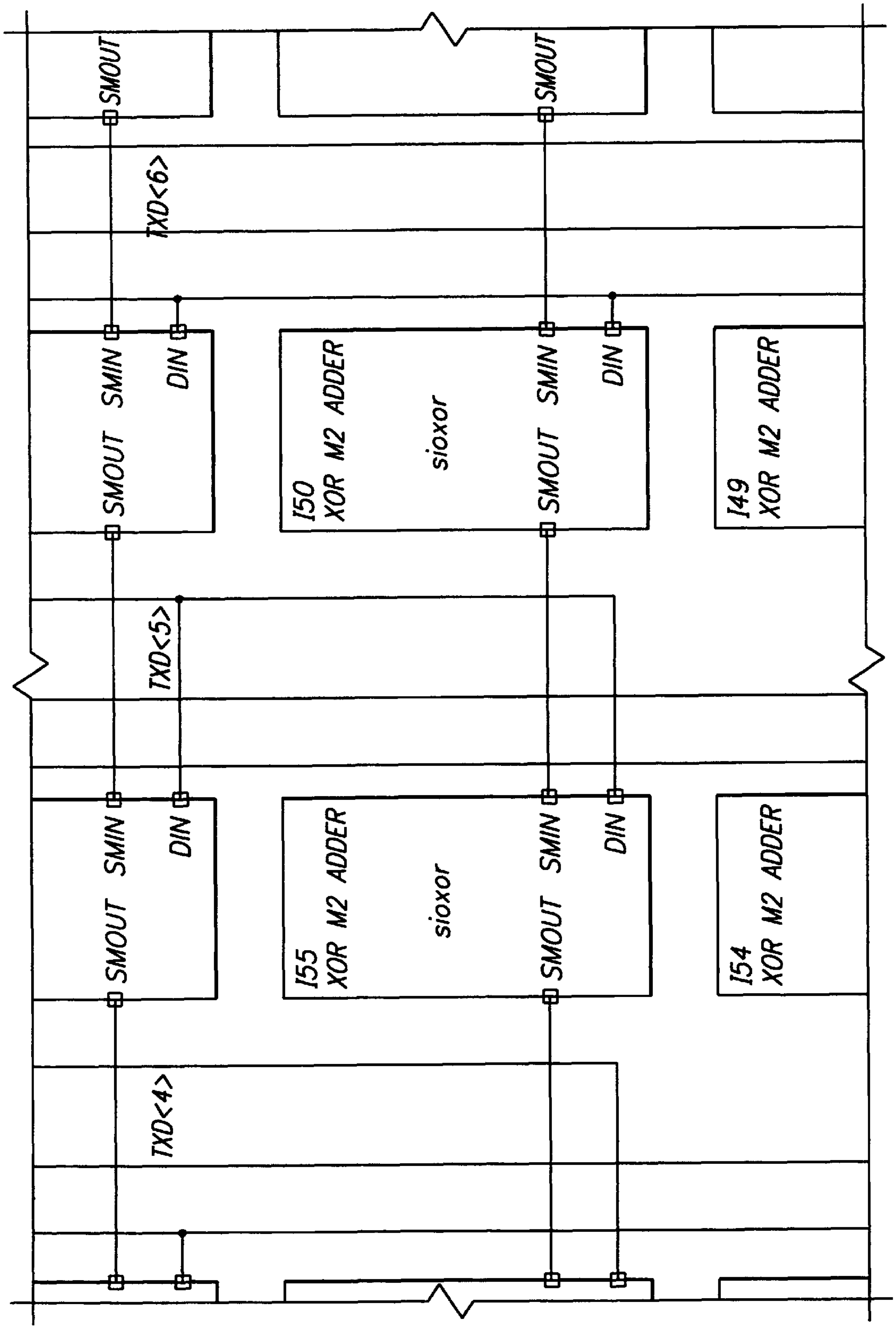
SMOUT
SMOUT
TXD<6>
SMOUT SMIN
DIN
I50
XOR M2 ADDER
sioxor
SMOUT SMIN
DIN
I49
XOR M2 ADDER
TXD<5>
SMOUT SMIN
DIN
I55
XOR M2 ADDER
sioxor
SMOUT SMIN
DIN
I54
XOR M2 ADDER
TXD<4>

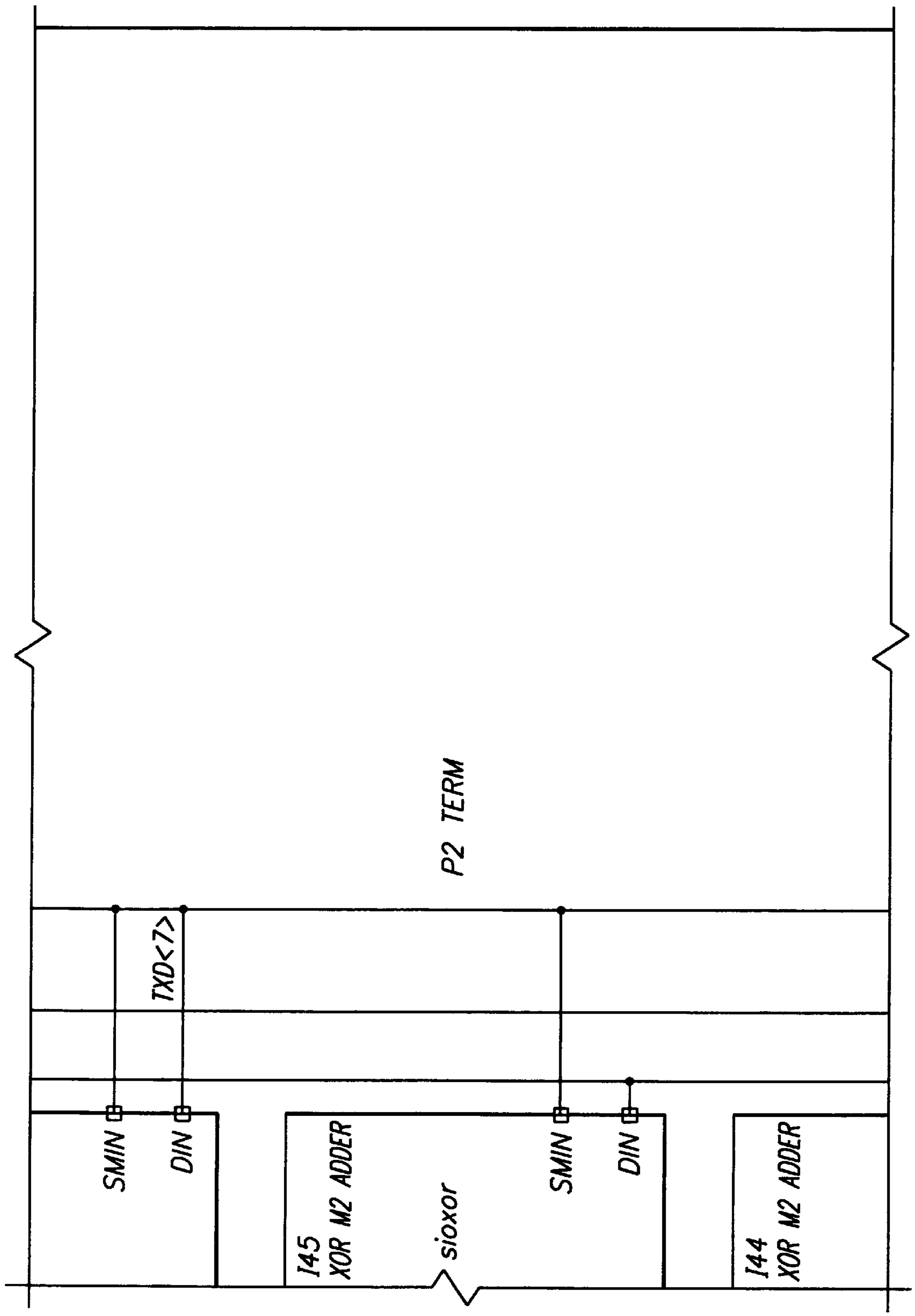
FIG. 7.1401DF

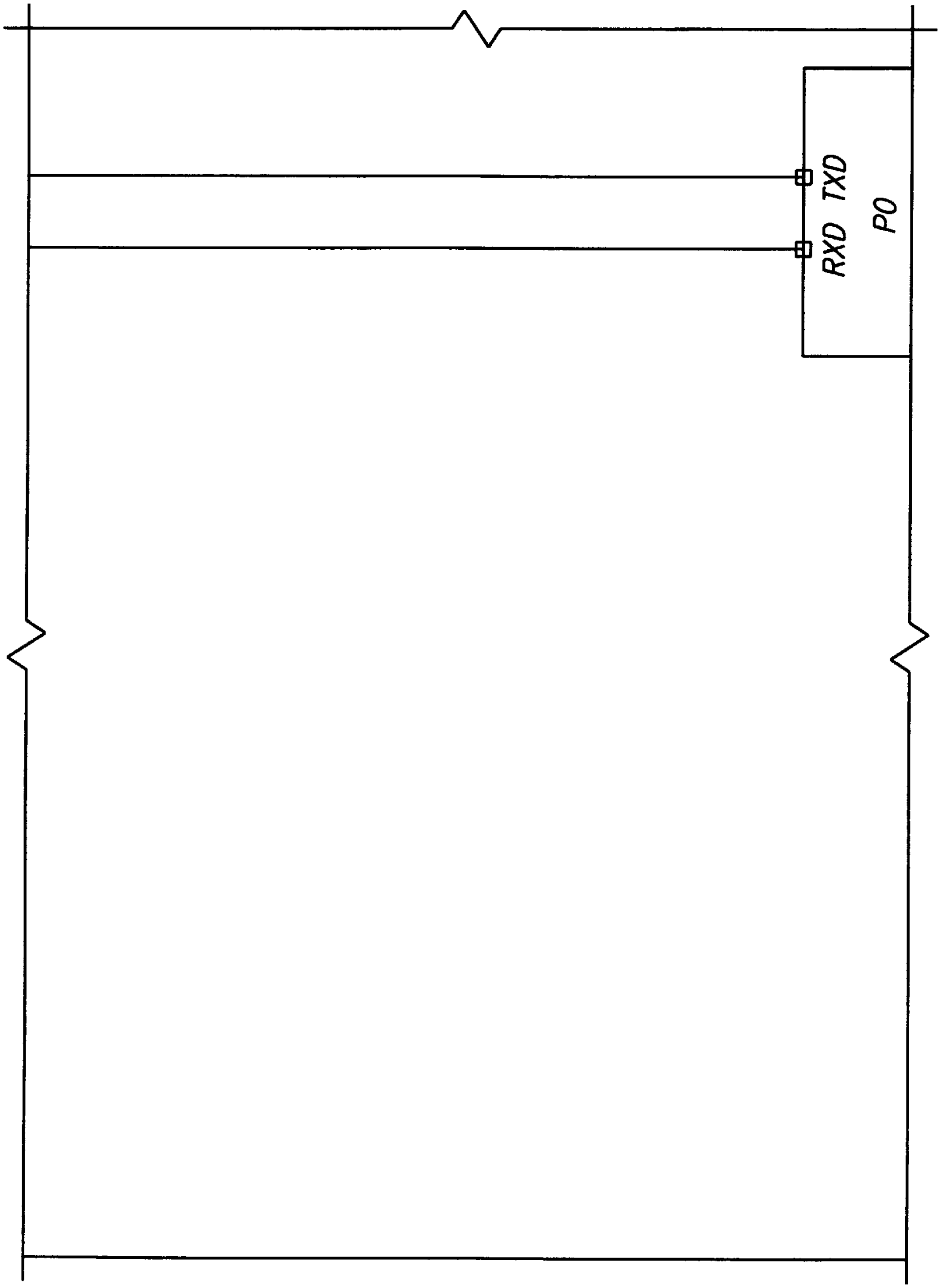
FIG. 7.1401EA

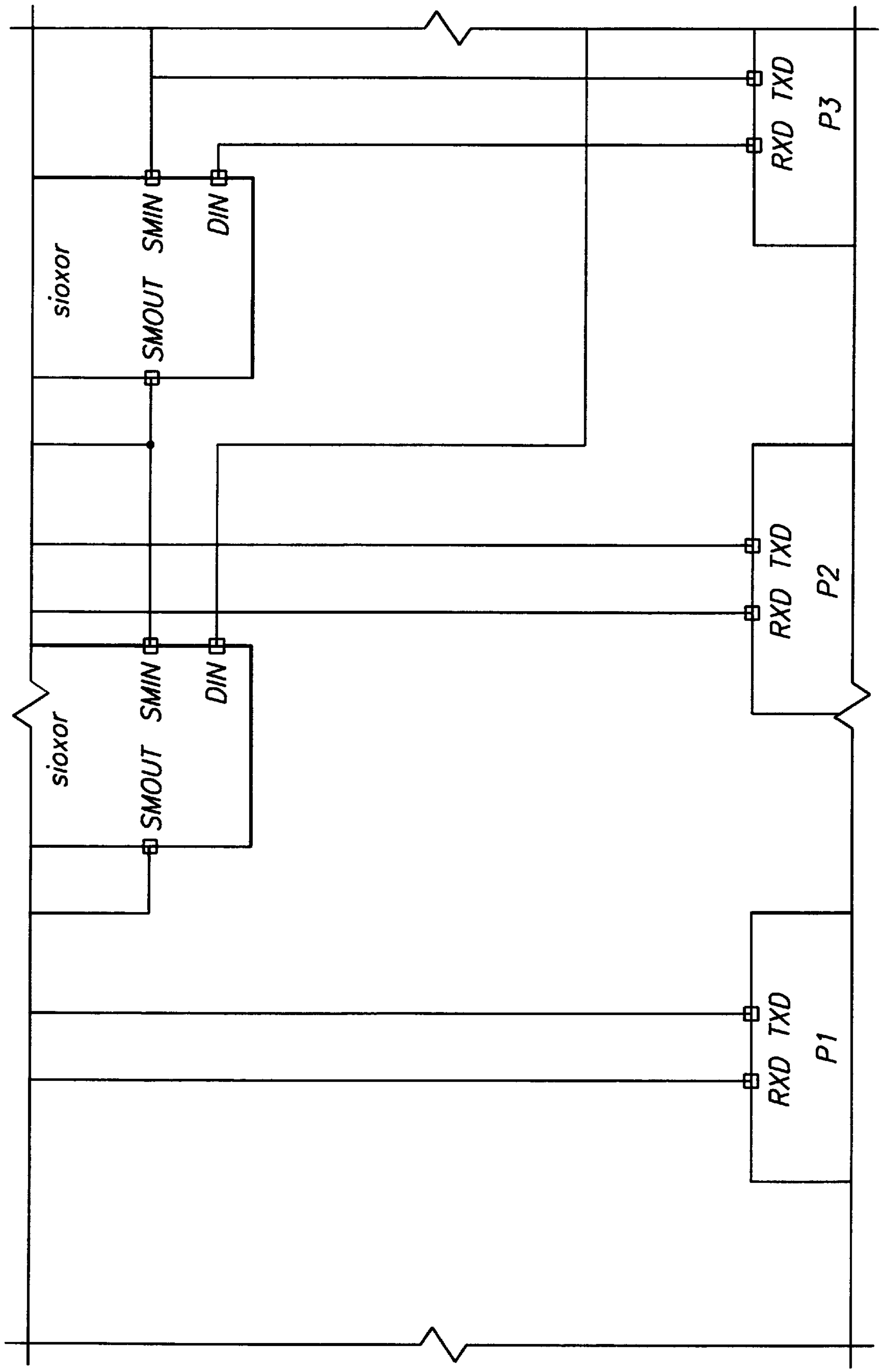
FIG. 7.140IEB

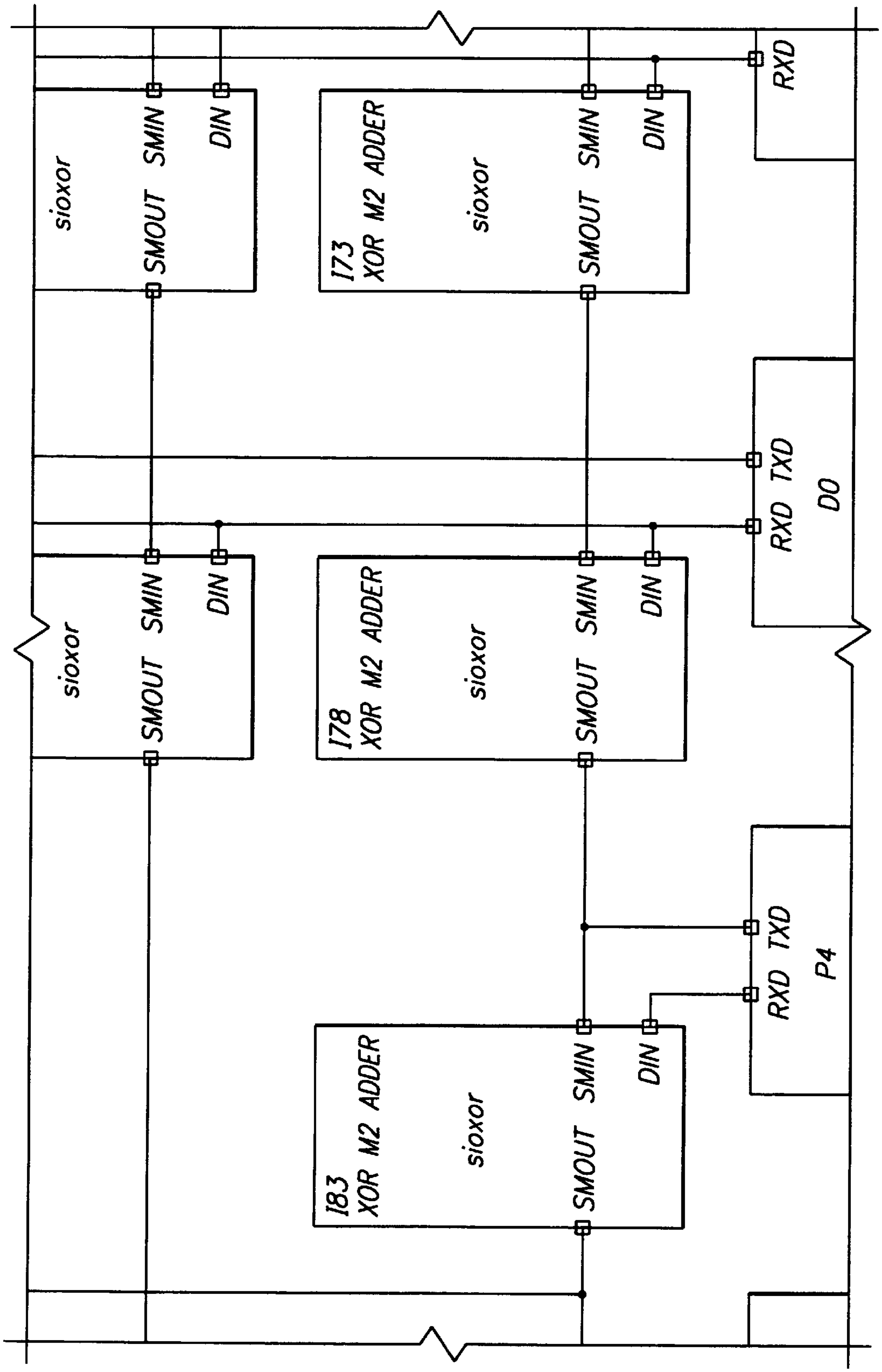
FIG. 7.140EE

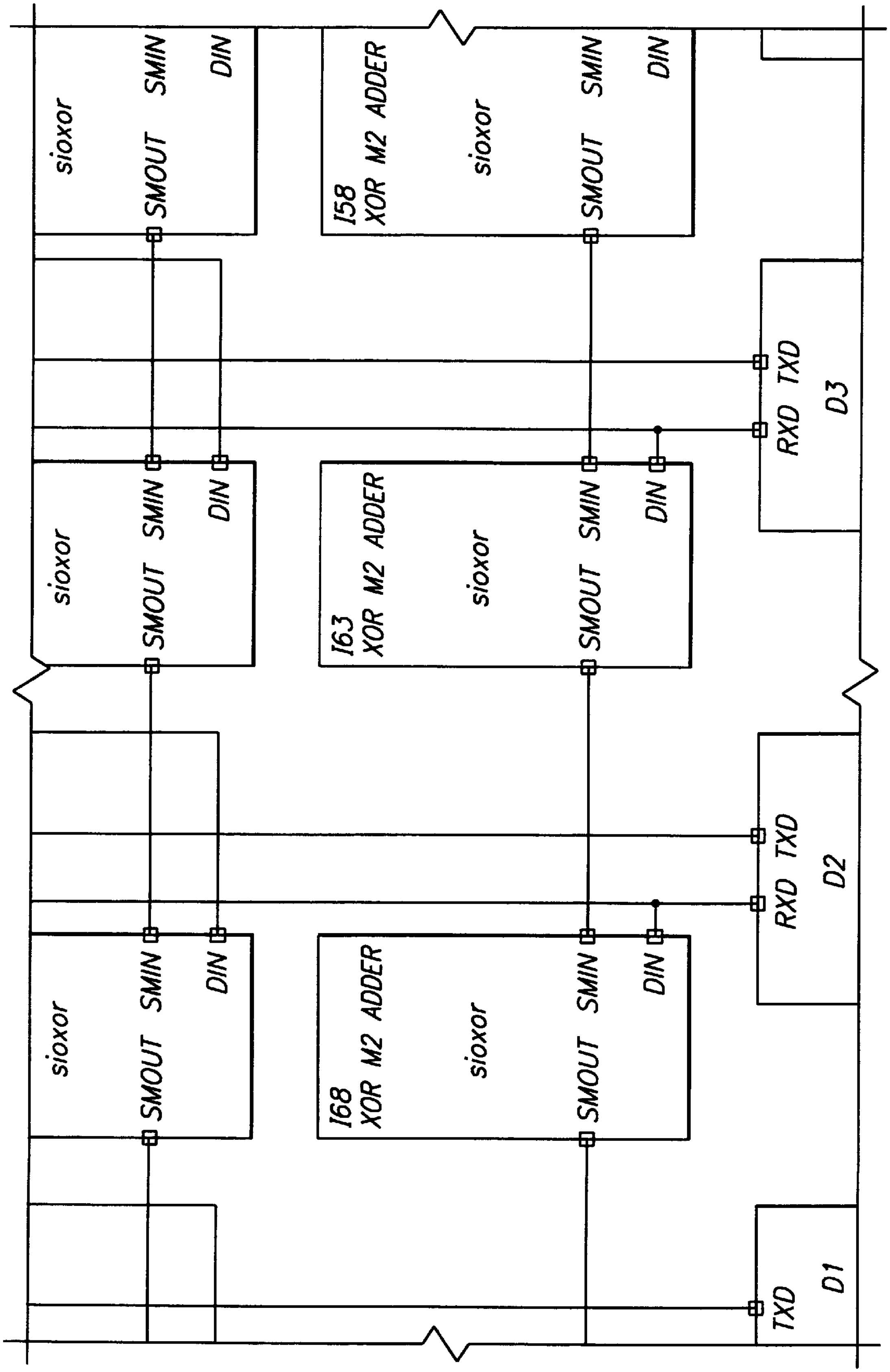
FIG. 7.14D1ED

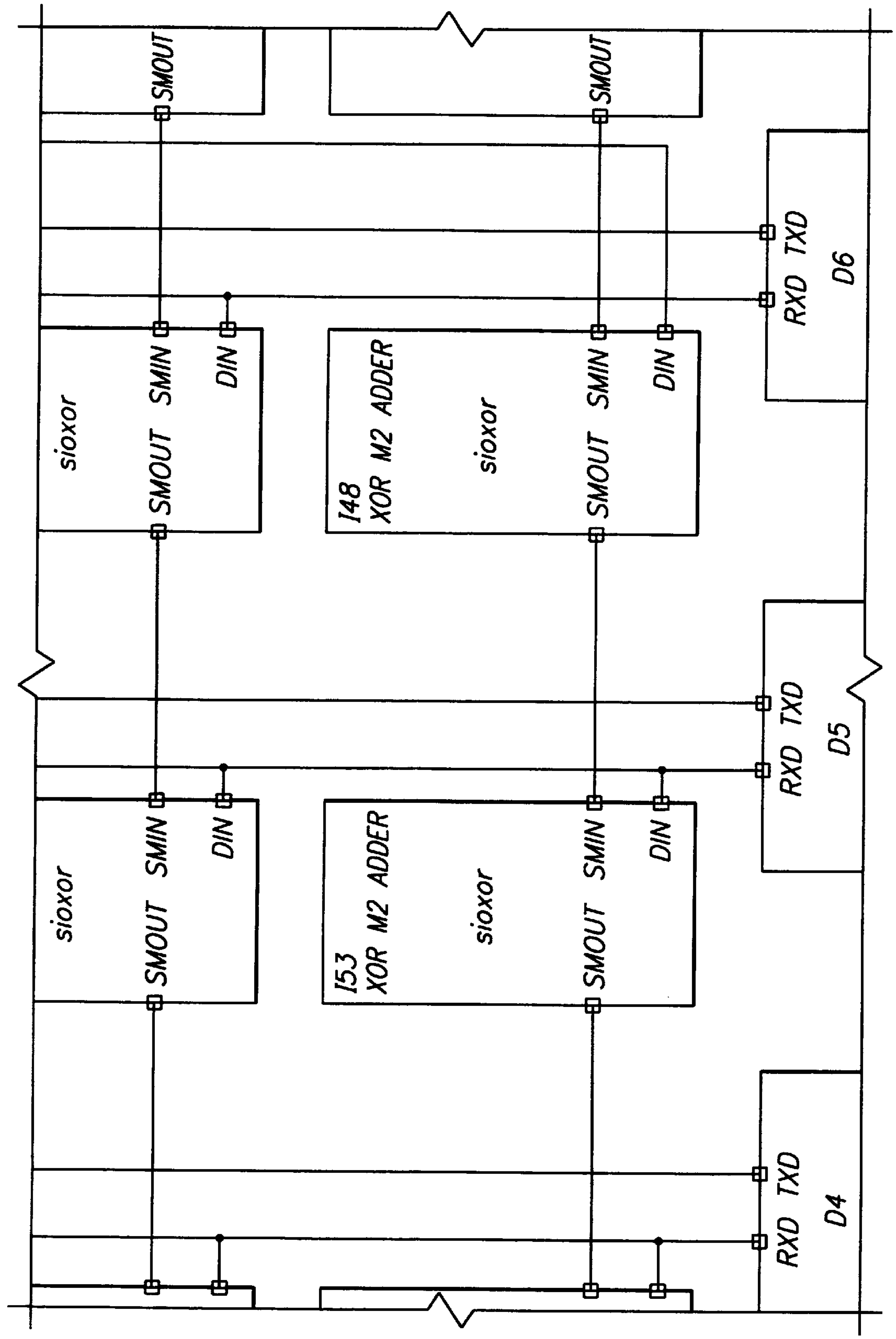
SMOUT
SMOUT
RXD TXD
D6
sioxor
SMOUT SMIN
DIN
I48
XOR M2 ADDER
sioxor
SMOUT SMIN
DIN
RXD TXD
D5
sioxor
SMOUT SMIN
DIN
I53
XOR M2 ADDER
sioxor
SMOUT SMIN
DIN
RXD TXD
D4

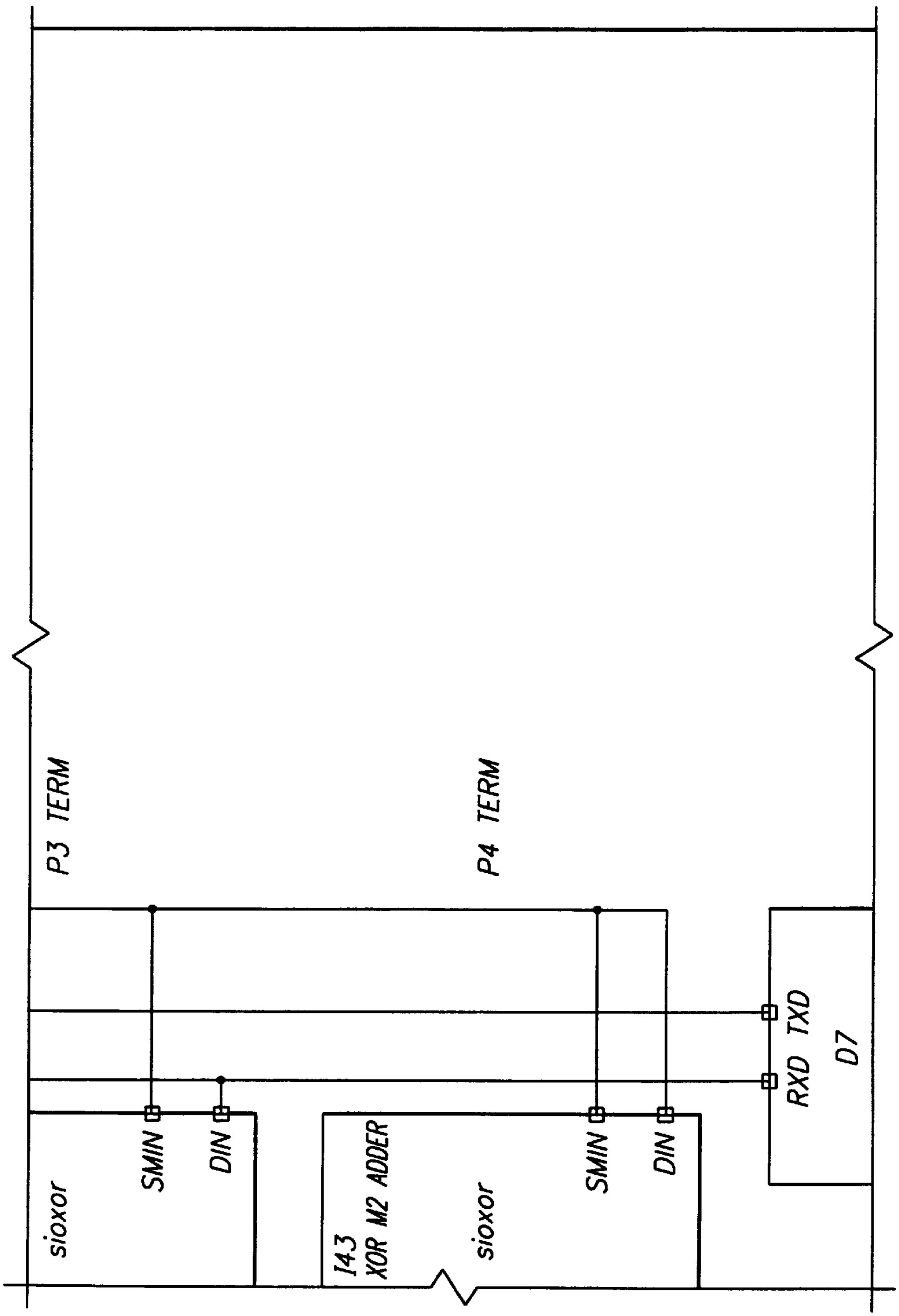
FIG. 7.140IEF

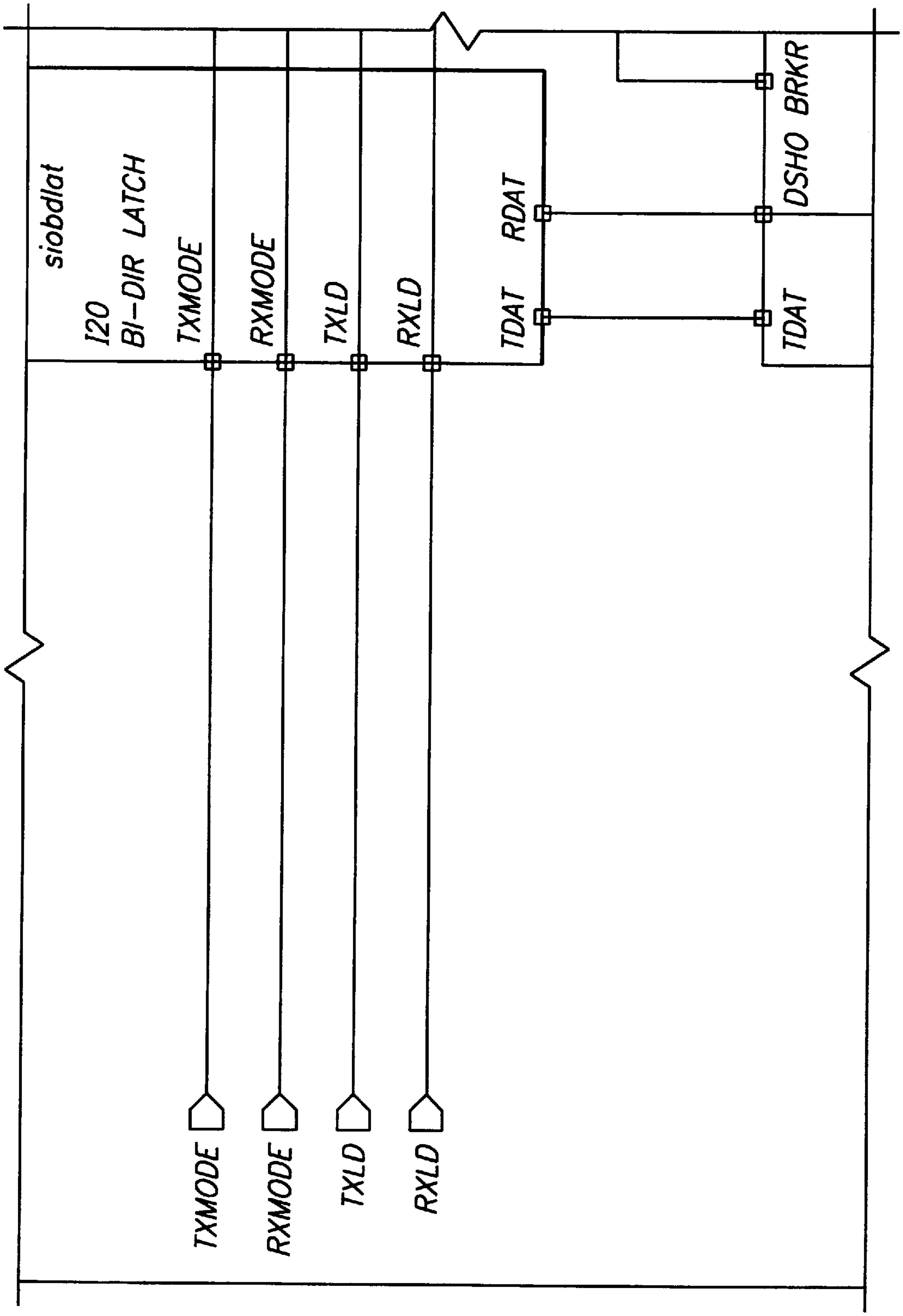
FIG. 7.140IFA

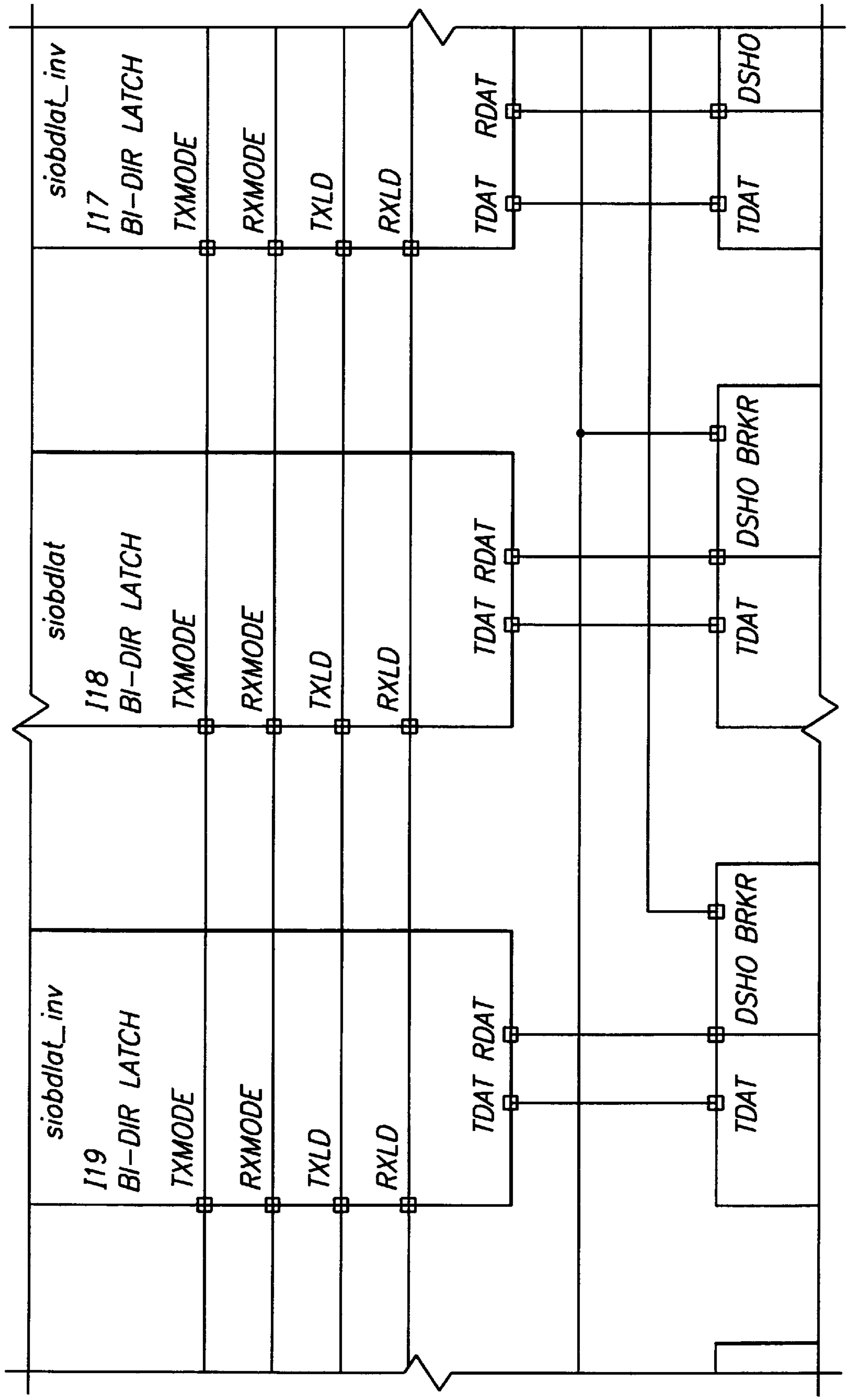
Fig. 7.1401FB

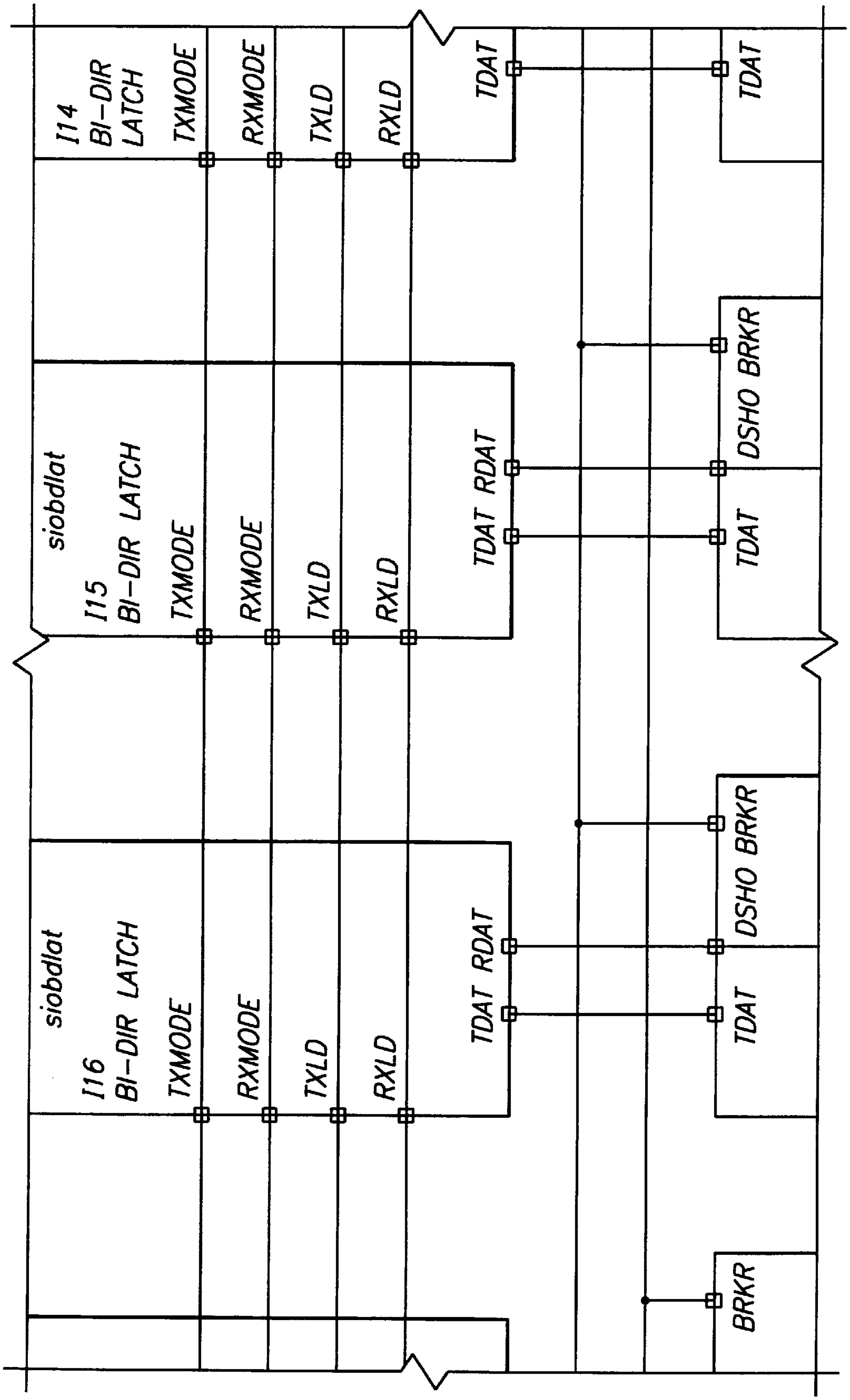
I14
BI-DIR
LATCH
TXMODE
RXMODE
TXLD
RXLD
TDAT
TDAT
siobdlat
I15
BI-DIR LATCH
TXMODE
RXMODE
TXLD
RXLD
TDAT RDAT
TDAT
DSHO BRKR
siobdlat
I16
BI-DIR LATCH
TXMODE
RXMODE
TXLD
RXLD
TDAT RDAT
TDAT
DSHO BRKR
BRKR

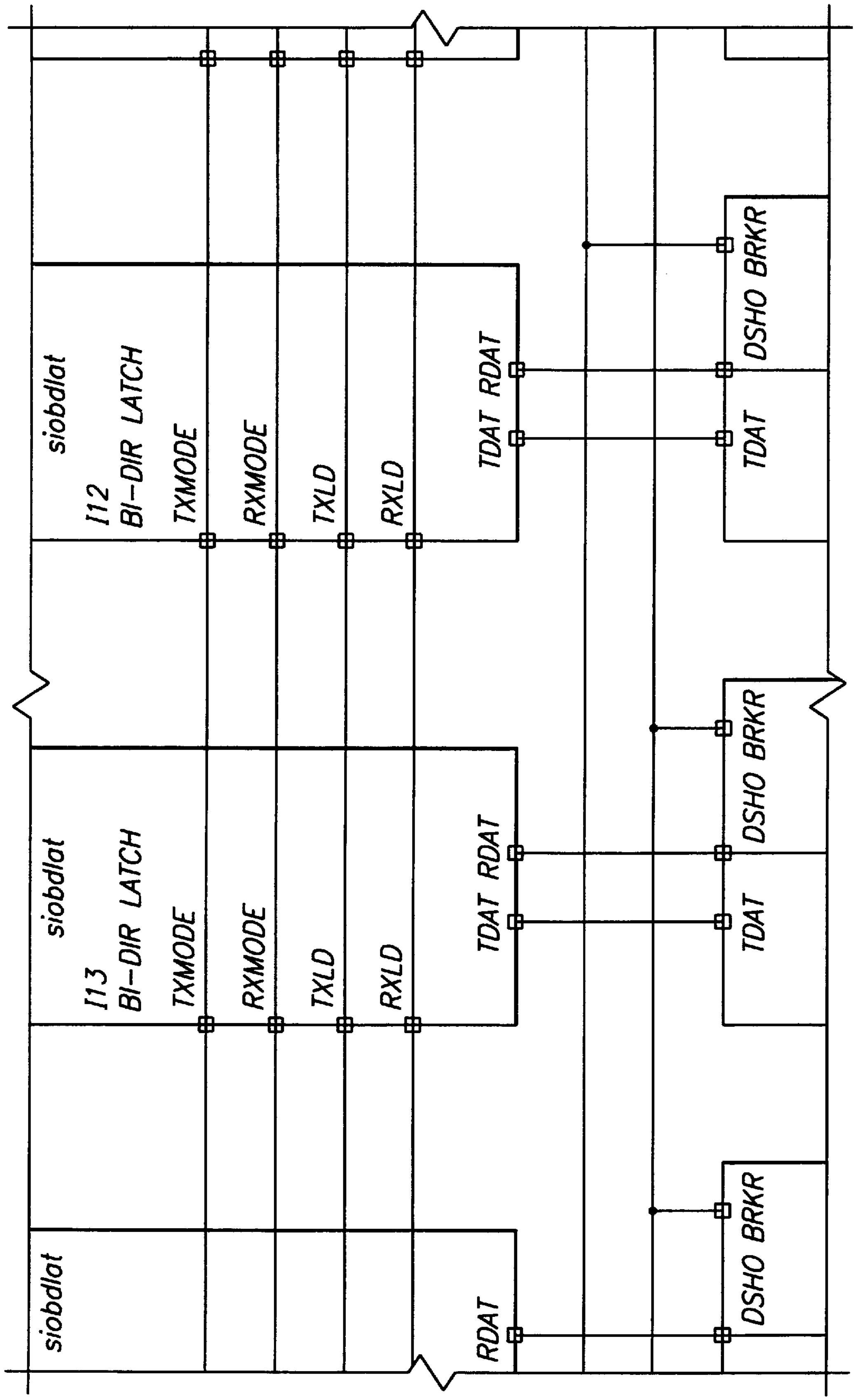
Fig. 7.1401FD

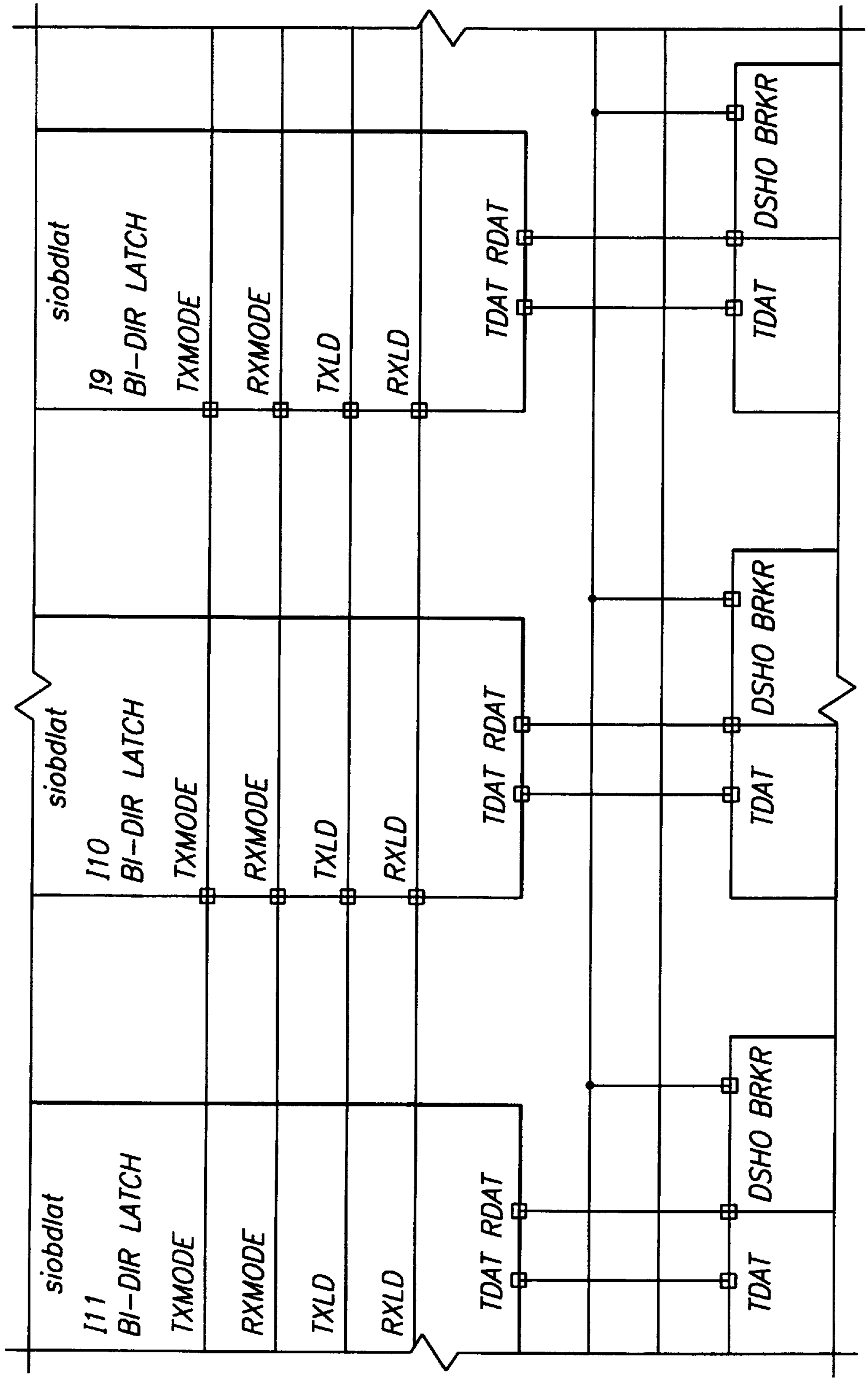
Fig. 7.140IIFE

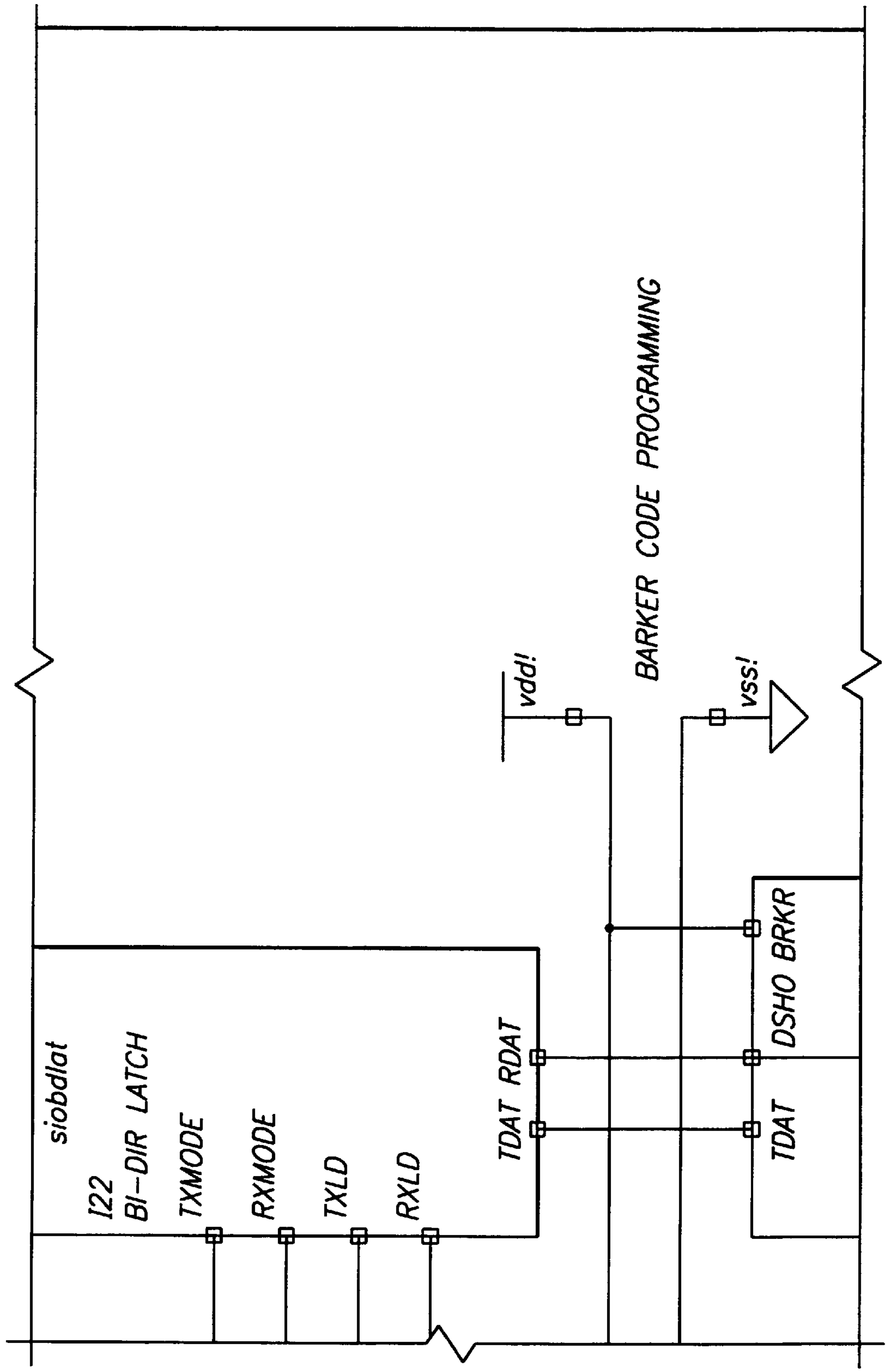
FIG. 7.1.4.0IFF

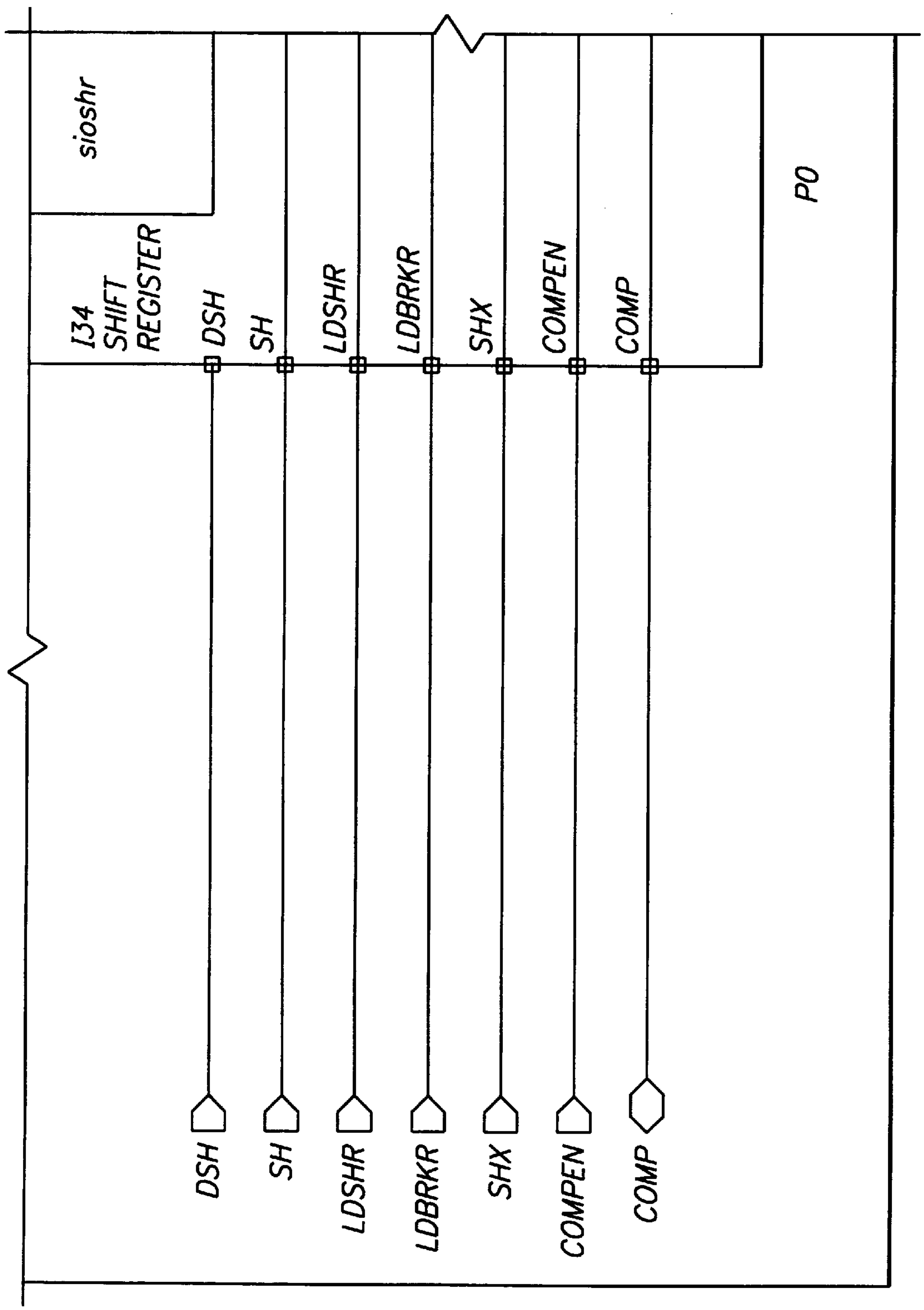
FIG. 7L.14IOIGA

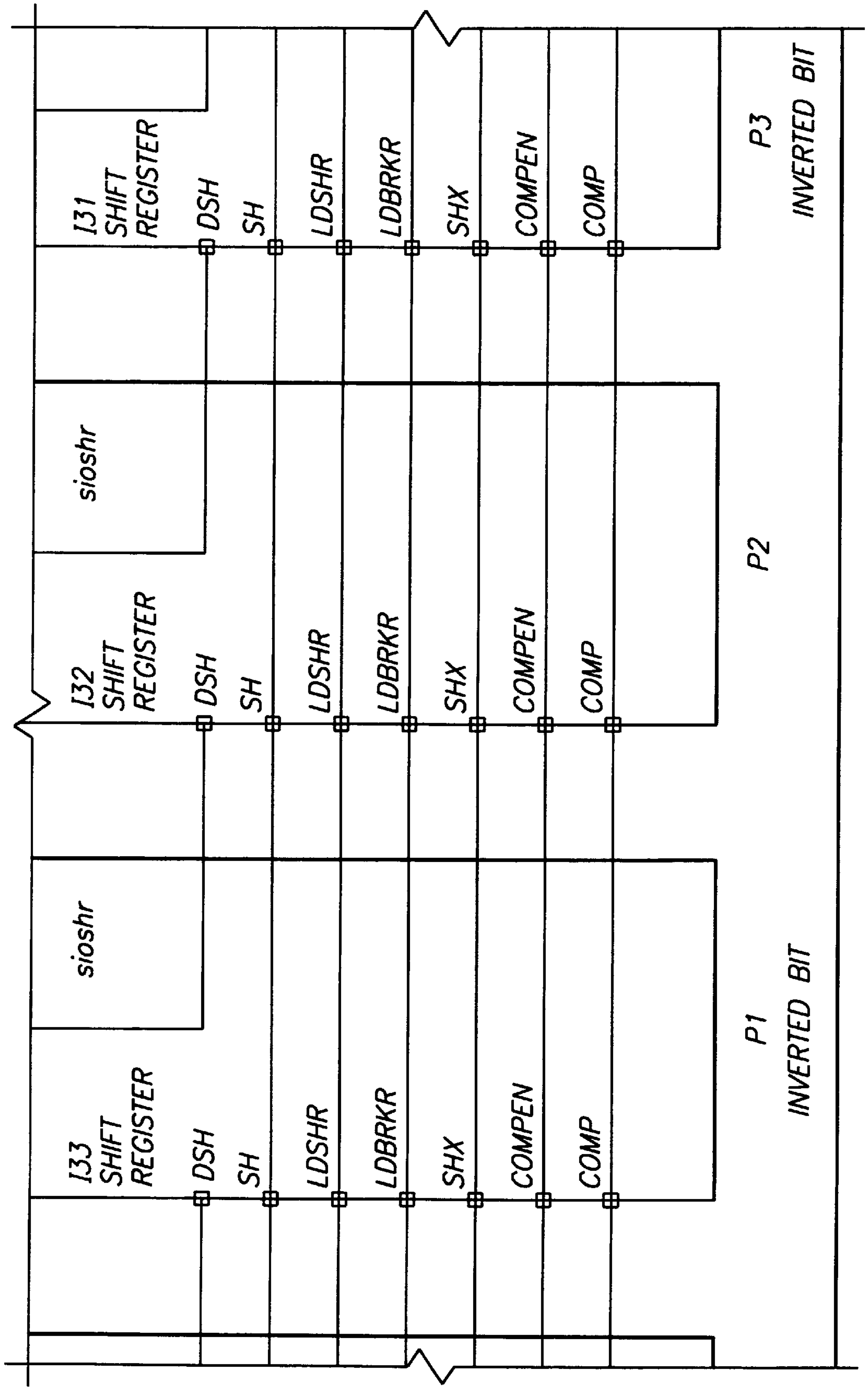
Fig. 7.14016B

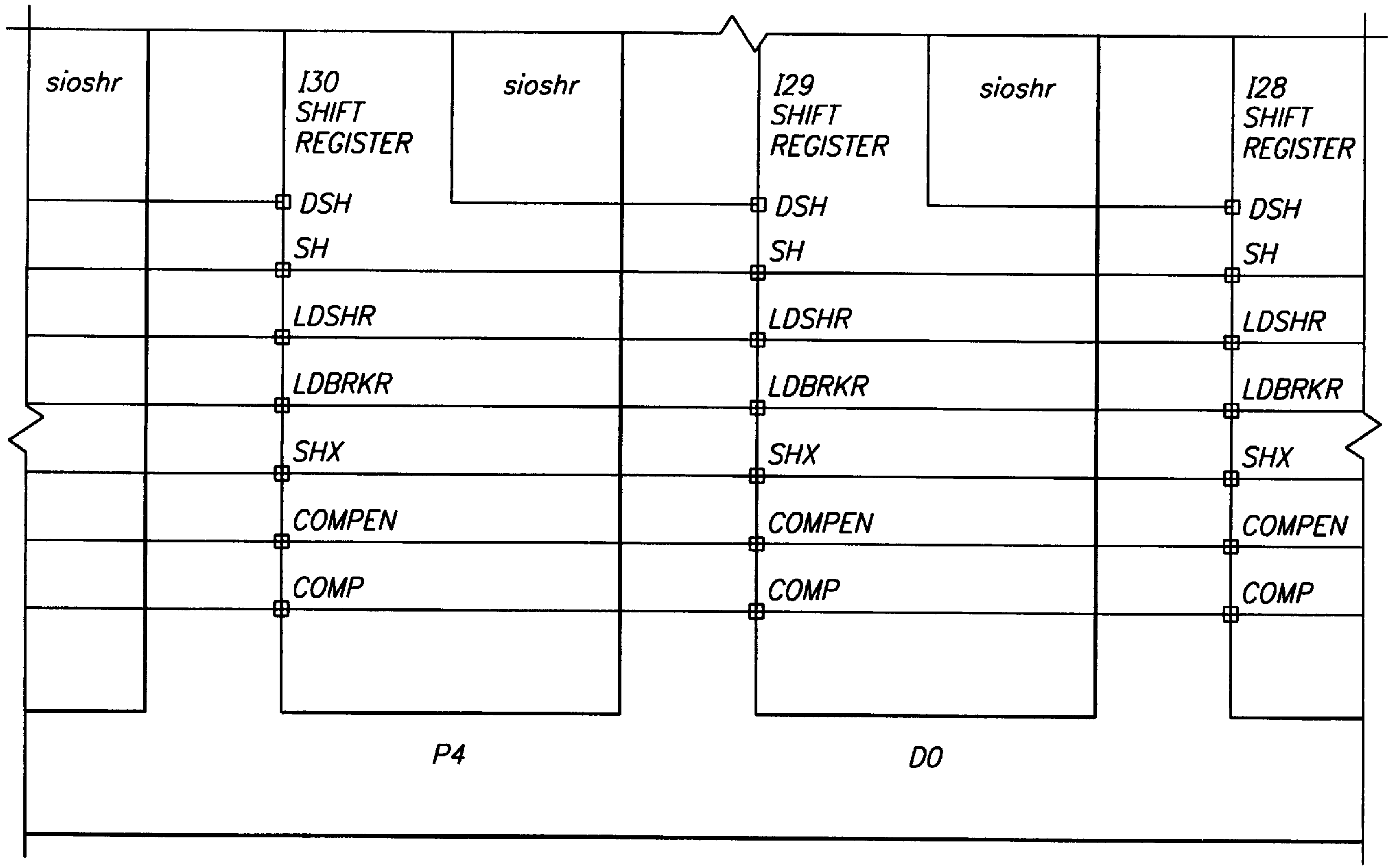
FIG. 7.1401GC

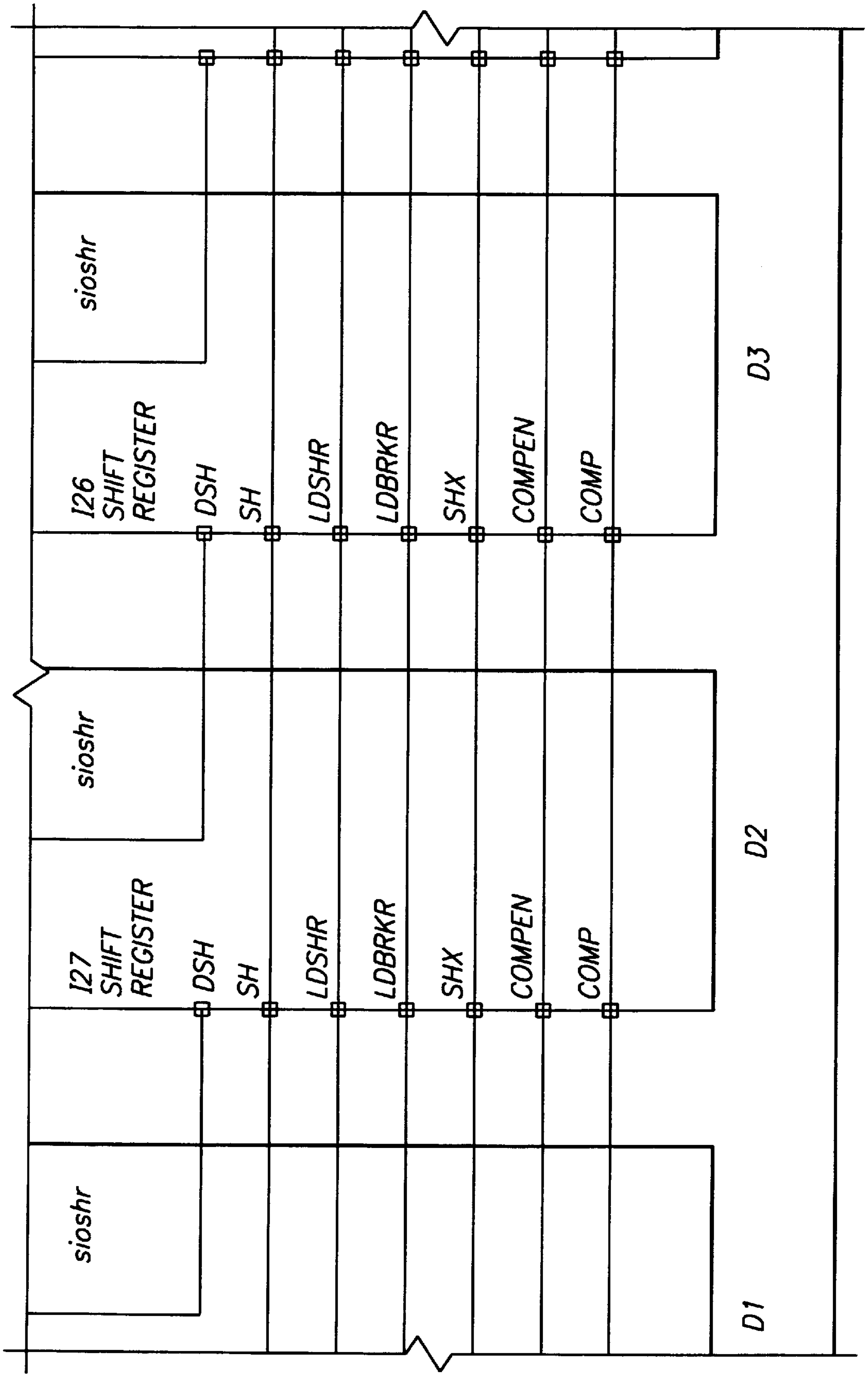
Fig. 7.140IGD

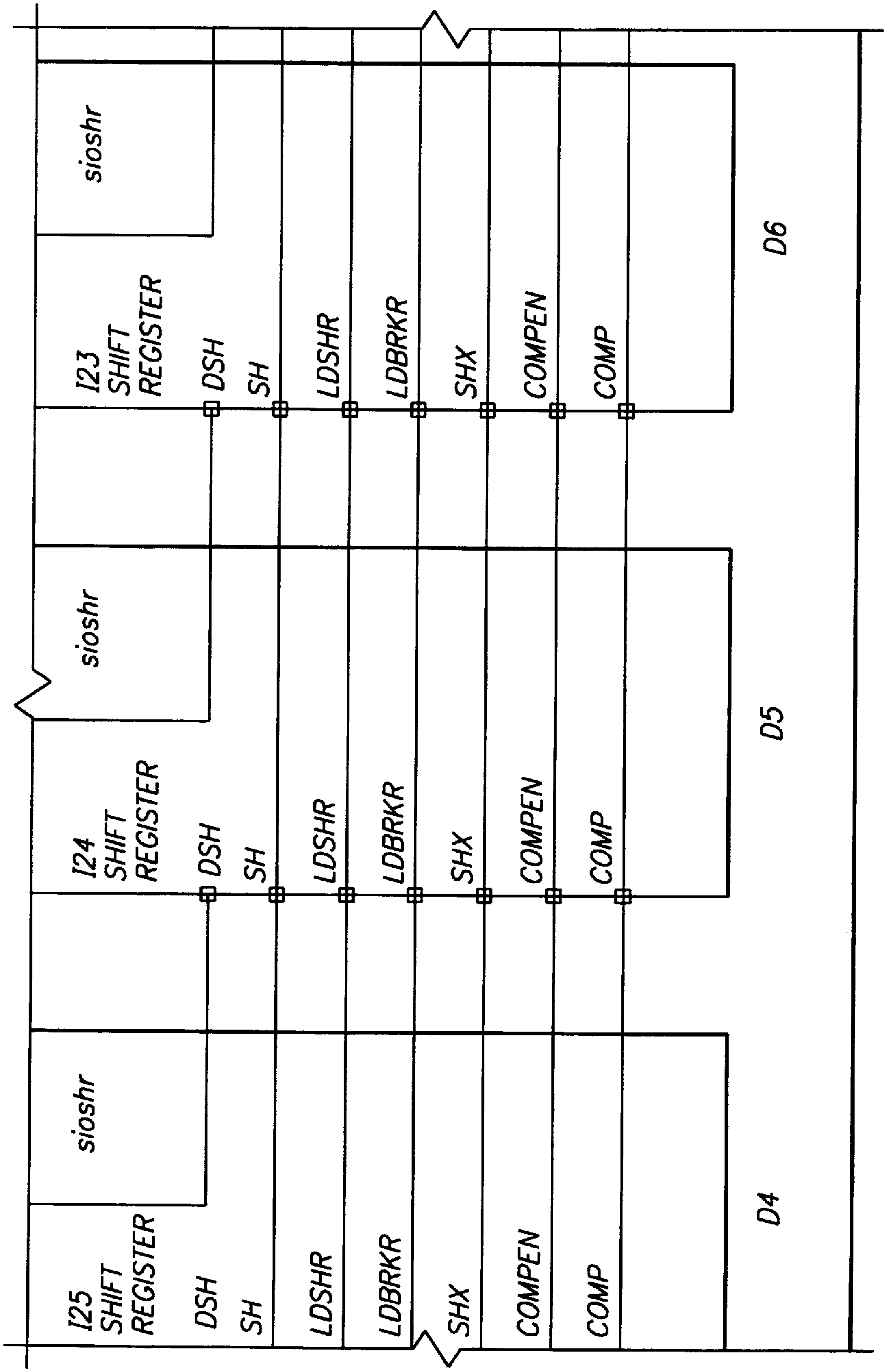
FIG. 7.14OIGE

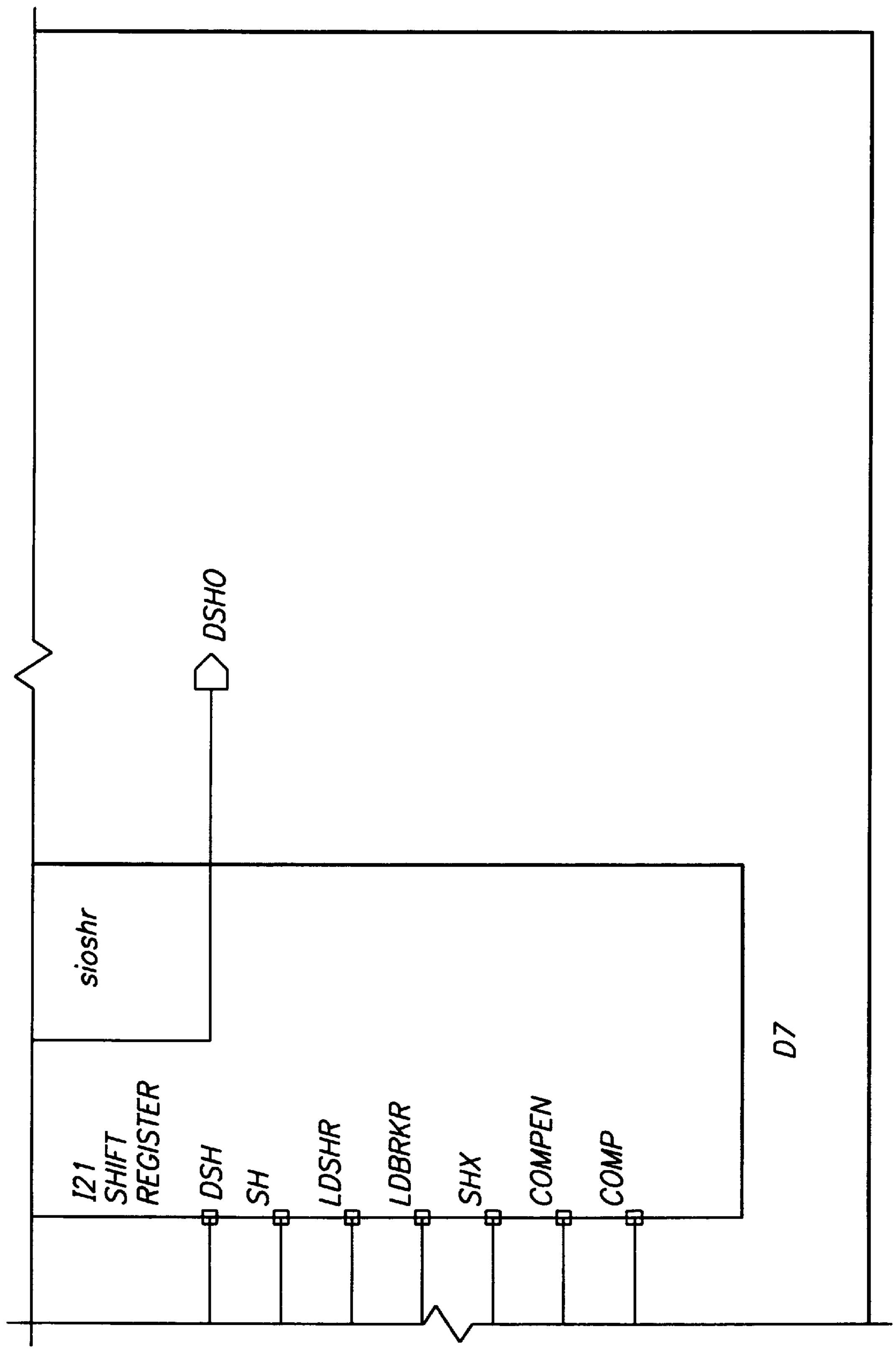
Fig. 7.140GF

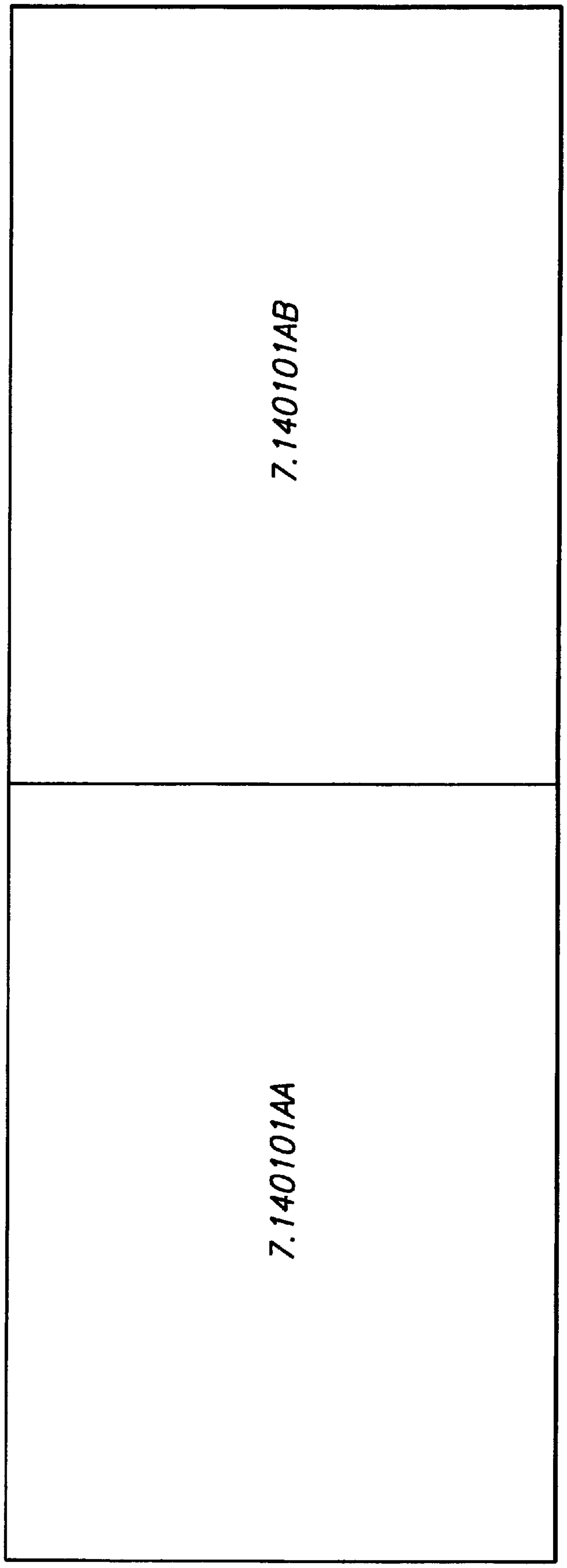
FIG. 7.140101

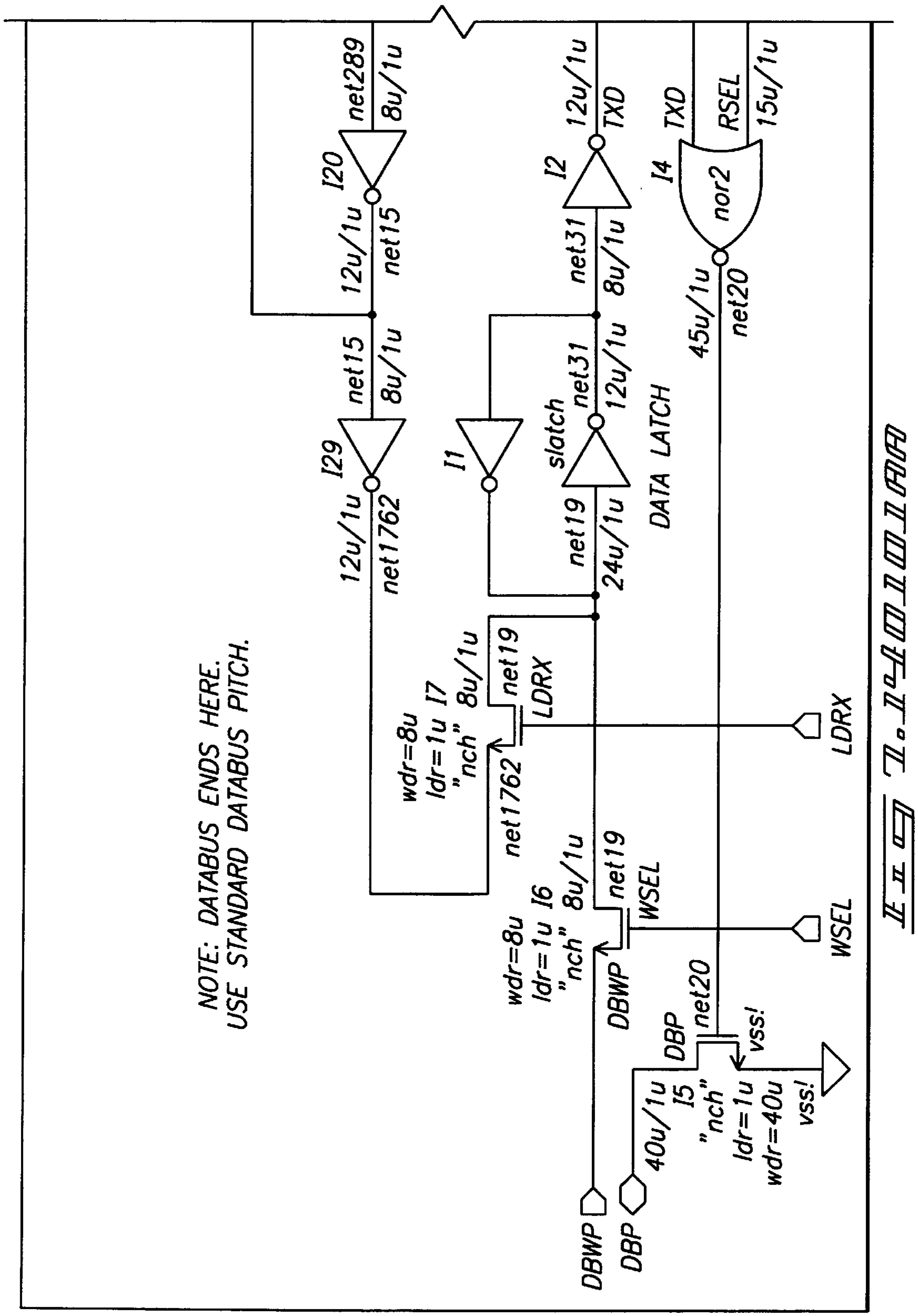
net289
8u/1u
I20
12u/1u
net15
net15
8u/1u
I29
12u/1u
net1762
12u/1u
TXD
I2
net31
8u/1u
net31
12u/1u
slatch
I1
net19
24u/1u
DATA LATCH
TXD
RSEL
15u/1u
I4
nor2
45u/1u
net20
NOTE: DATABUS ENDS HERE.
USE STANDARD DATABUS PITCH.
wdr=8u
ldr=1u I7
"nch" 8u/1u
net19
LDRX
net1762
LDRX
wdr=8u
ldr=1u I6
"nch" 8u/1u
net19
WSEL
DBWP
WSEL
DBP
net20
vss!
40u/1u
I5
"nch"
ldr=1u
wdr=40u
vss!
DBWP
DBP

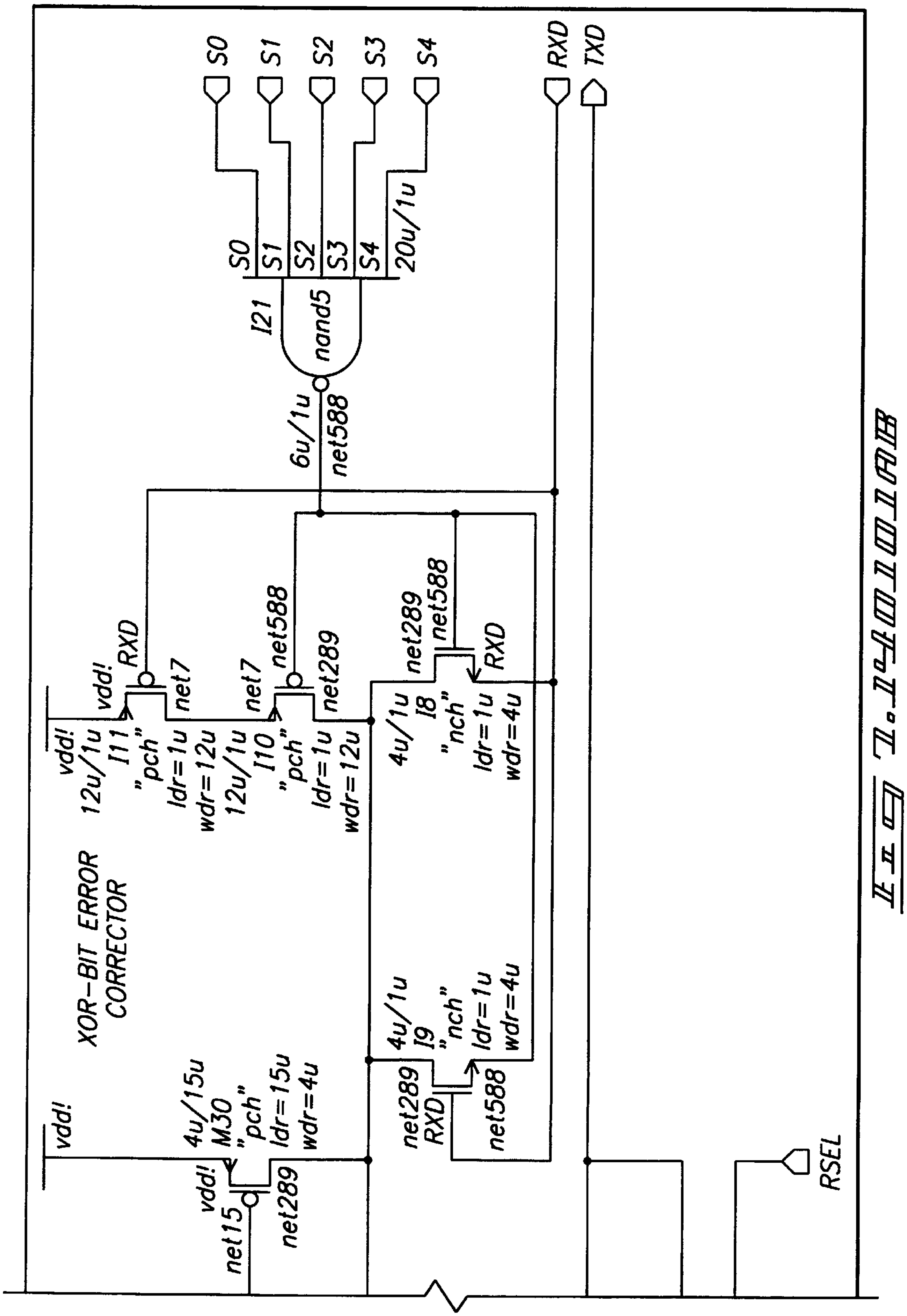
S0
S1
S2
S3
S4
RXD
TXD
20u/1u
I21
nand5
6u/1u
net588
XOR-BIT ERROR CORRECTOR
vdd!
12u/1u
I11
"pch"
ldr=1u
wdr=12u
net7
I10
net289
4u/1u
I8
"nch"
wdr=4u
I9
4u/15u
M30
ldr=15u
net15
RSEL

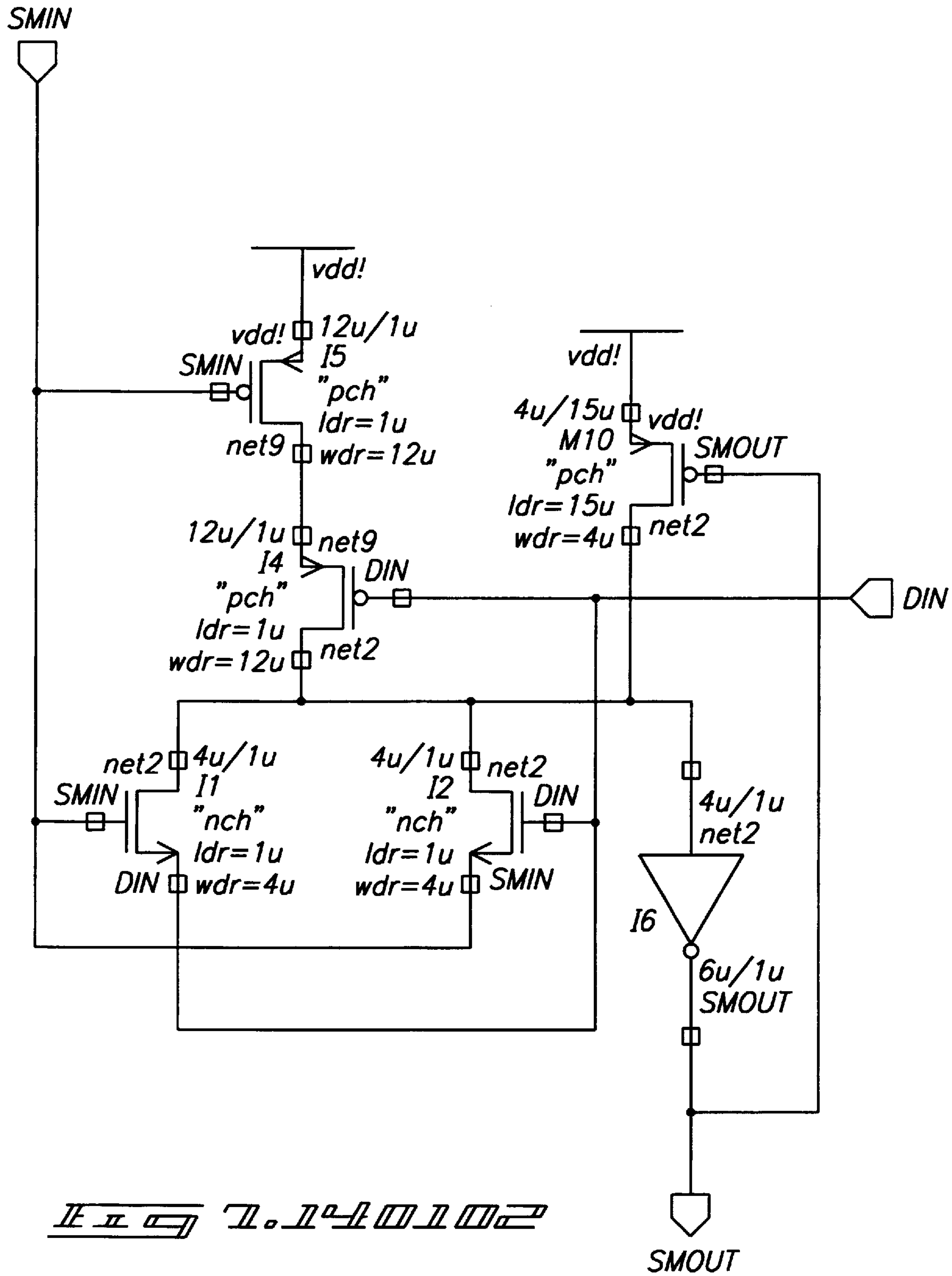
Fig 7.140102

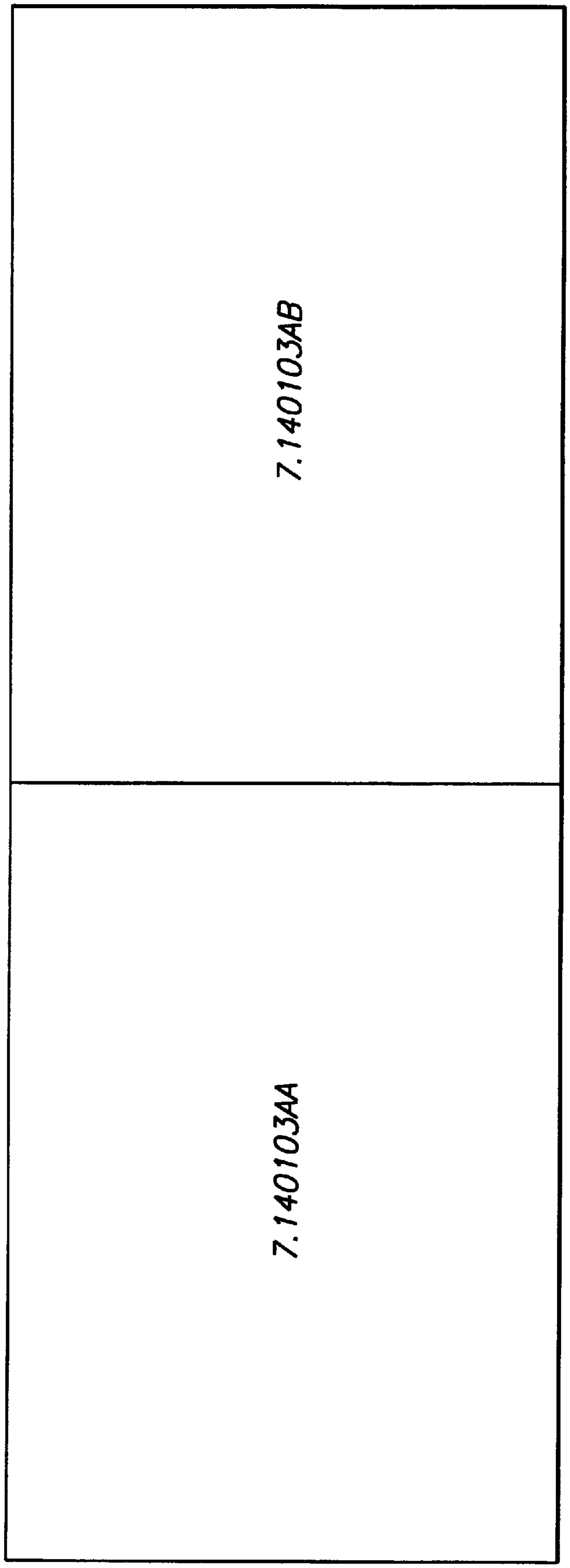
FIG. 7.140103

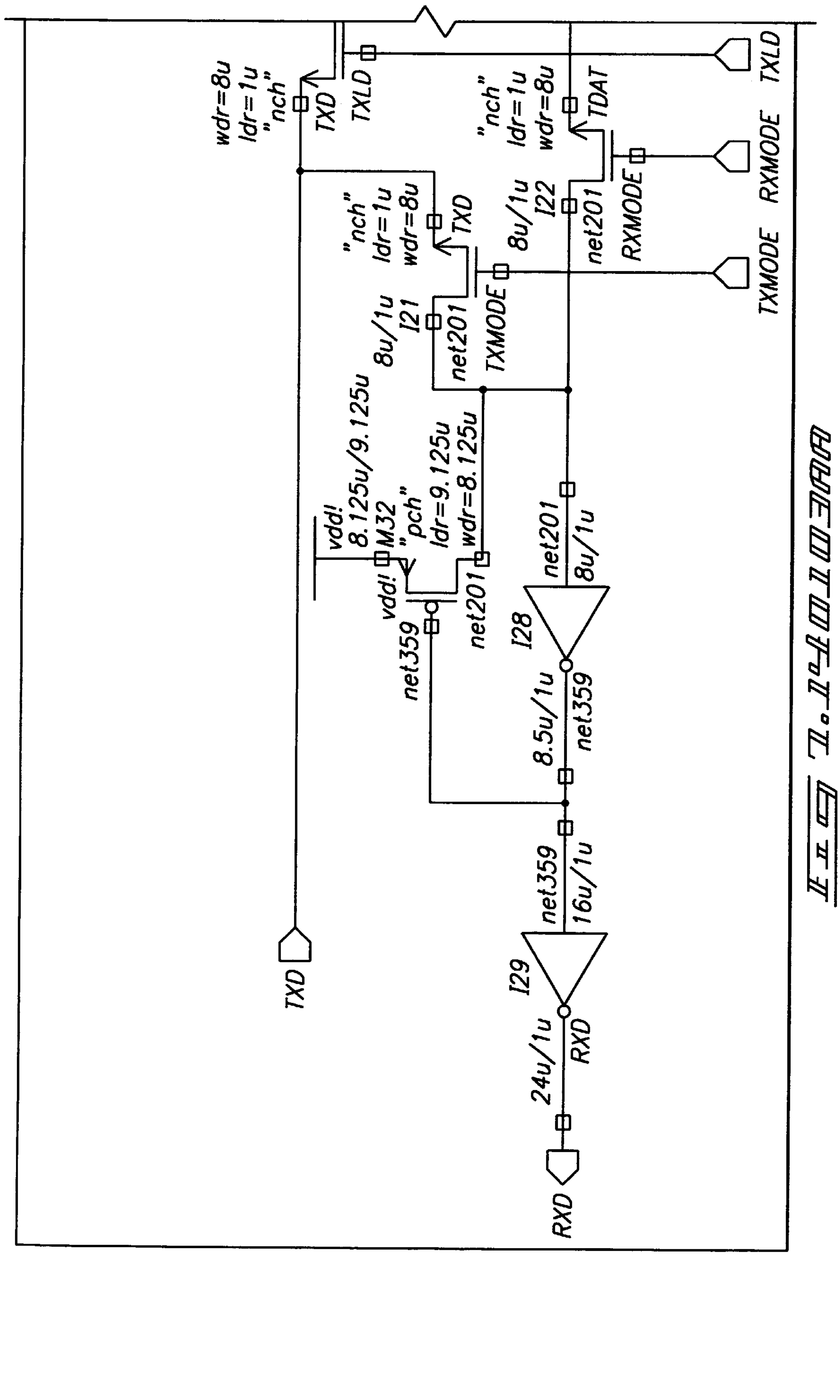
FIG. 1.14D1D1EAA

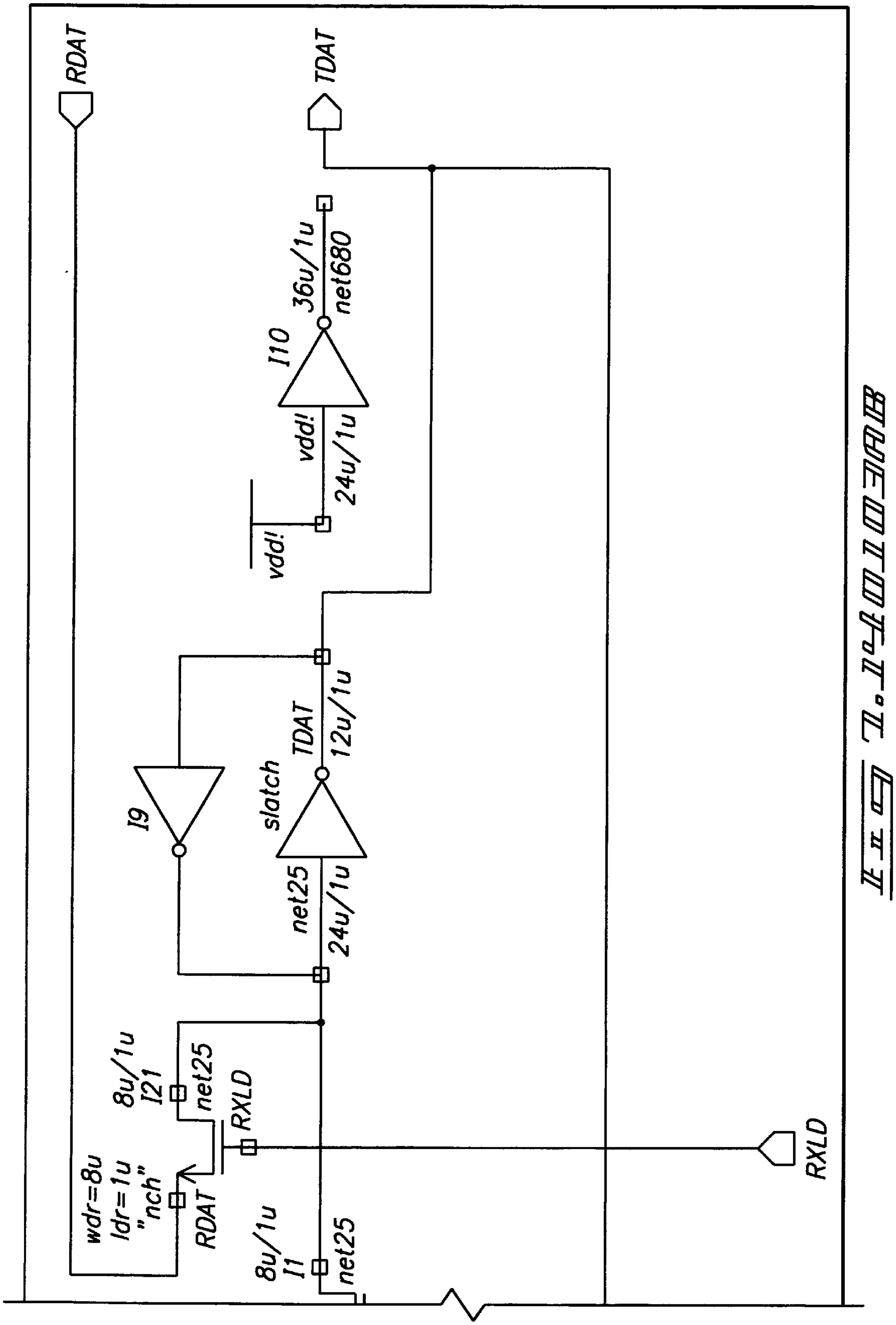
RDAT
TDAT
36u/1u
net680
I10
vdd!
24u/1u
vdd!
TDAT
12u/1u
slatch
I9
net25
24u/1u
8u/1u
I21
net25
RXLD
wdr=8u
ldr=1u
"nch"
RDAT
8u/1u
I1
net25
RXLD

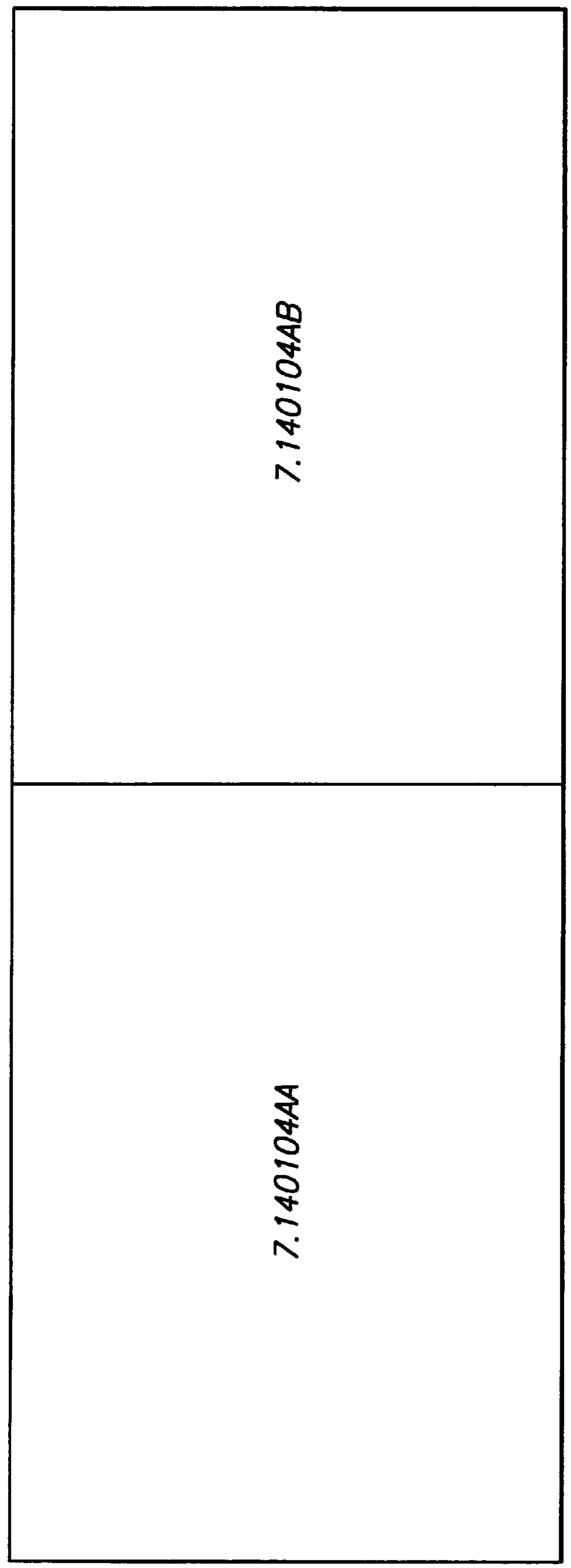
FIG. 7.140104A

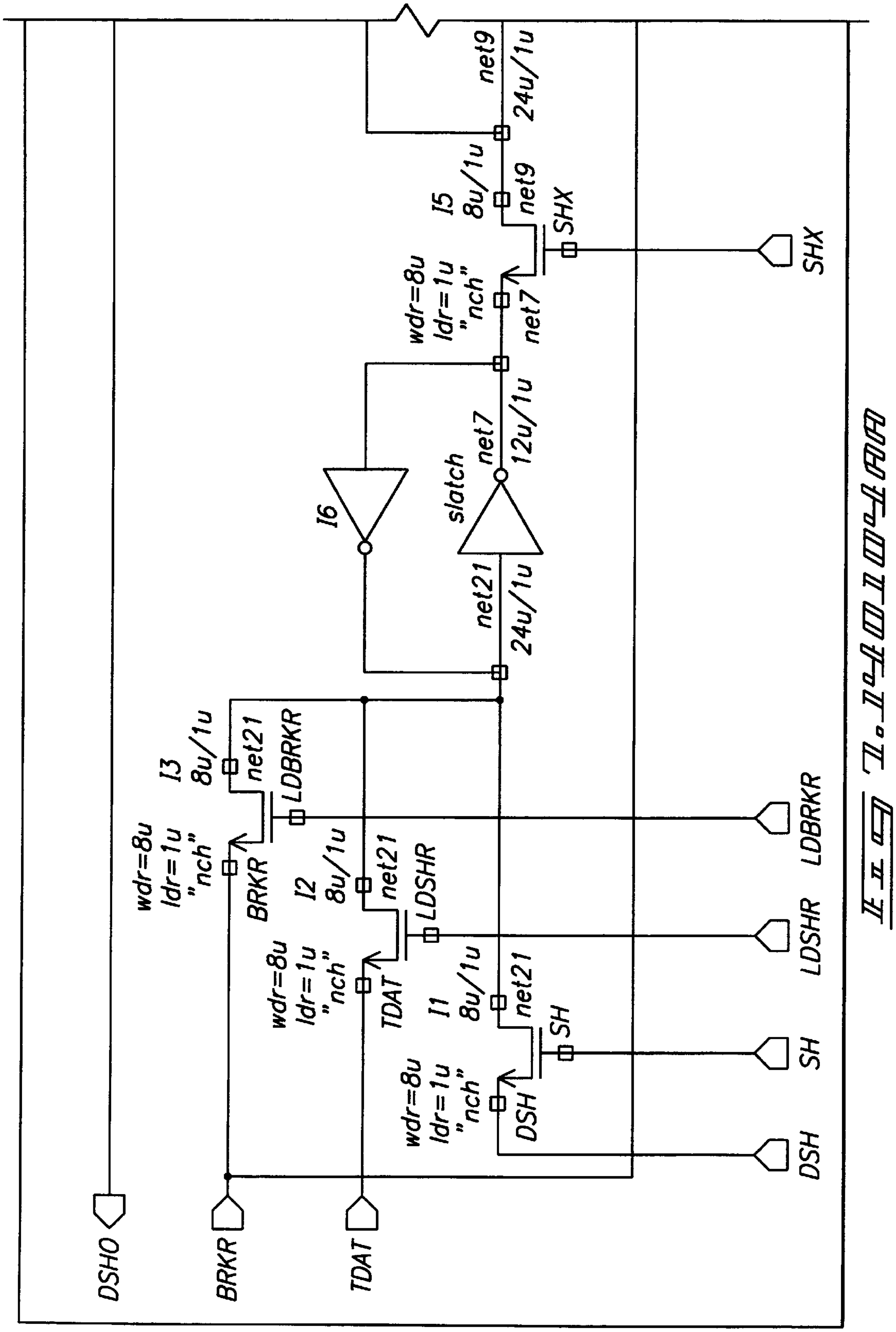
FIG. 11.101.04AA

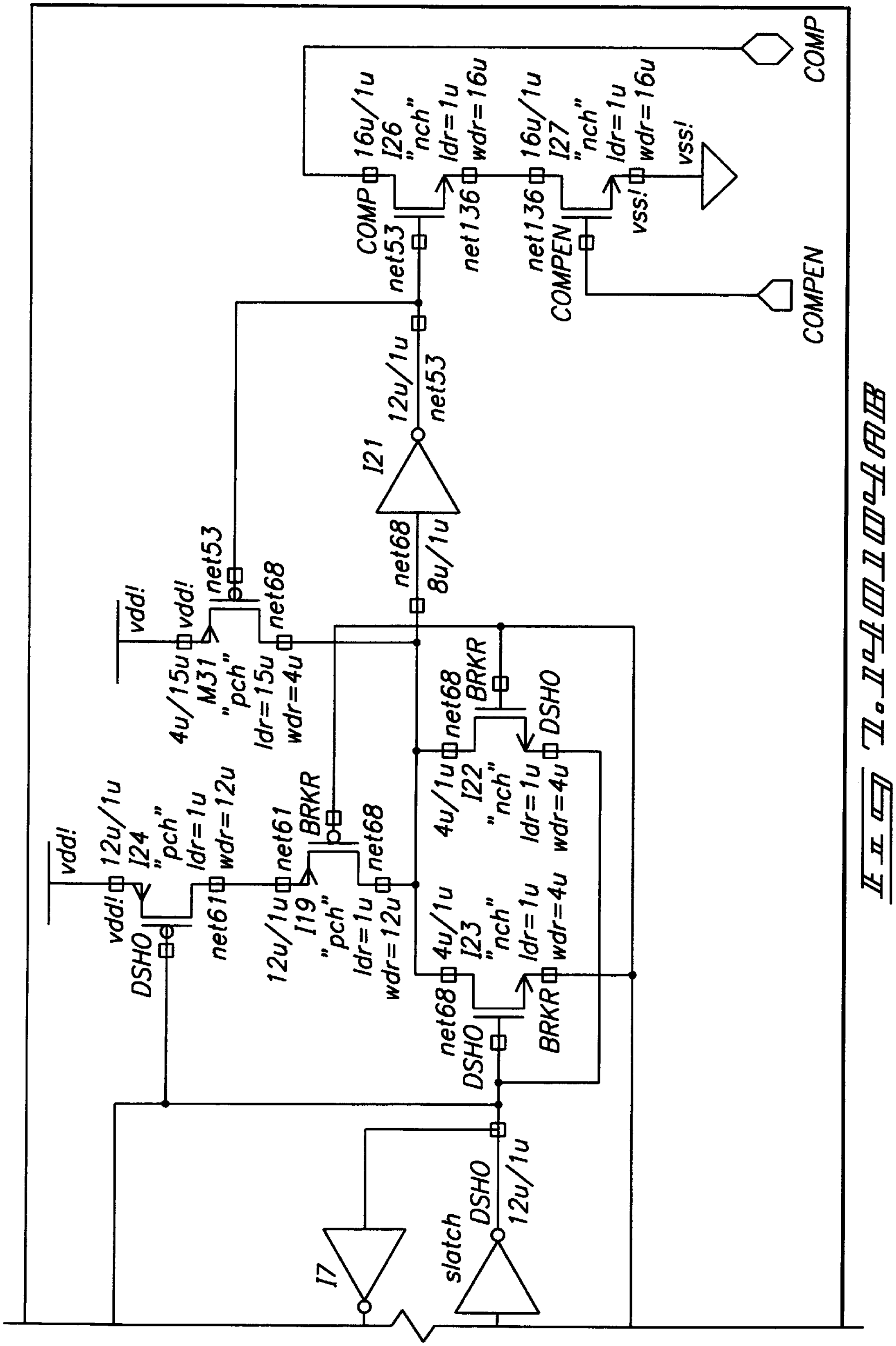
Fig. 7.104104AB

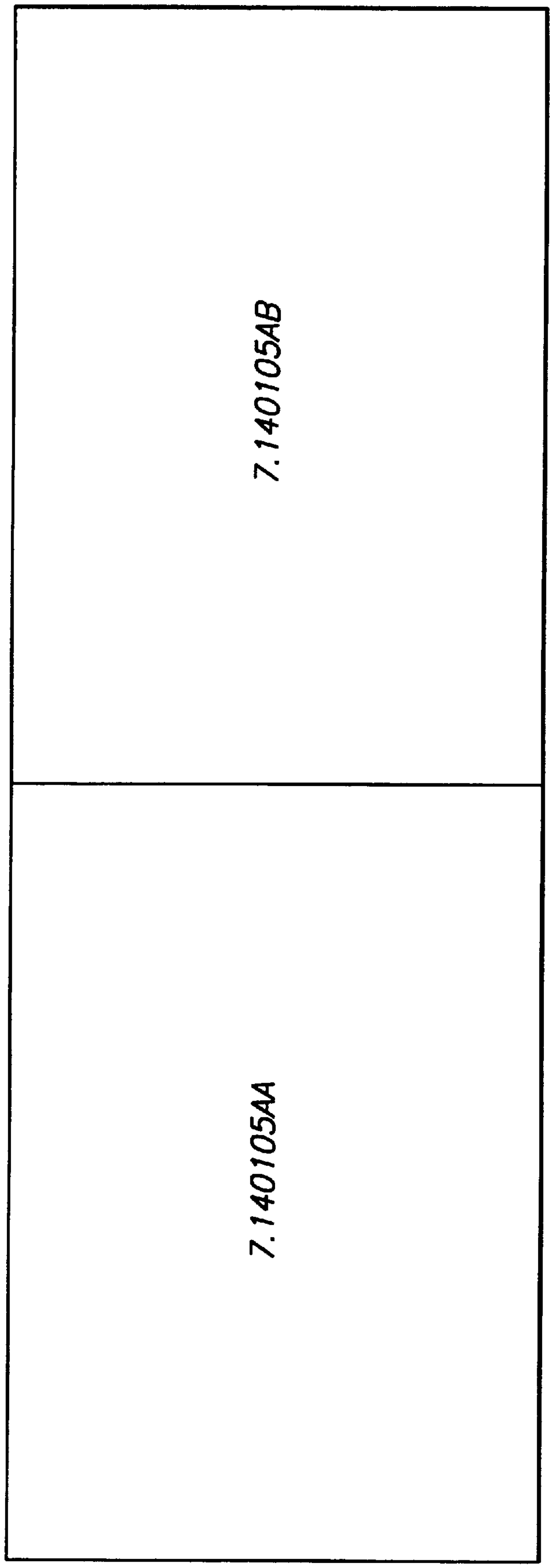
FIG. 7.140105

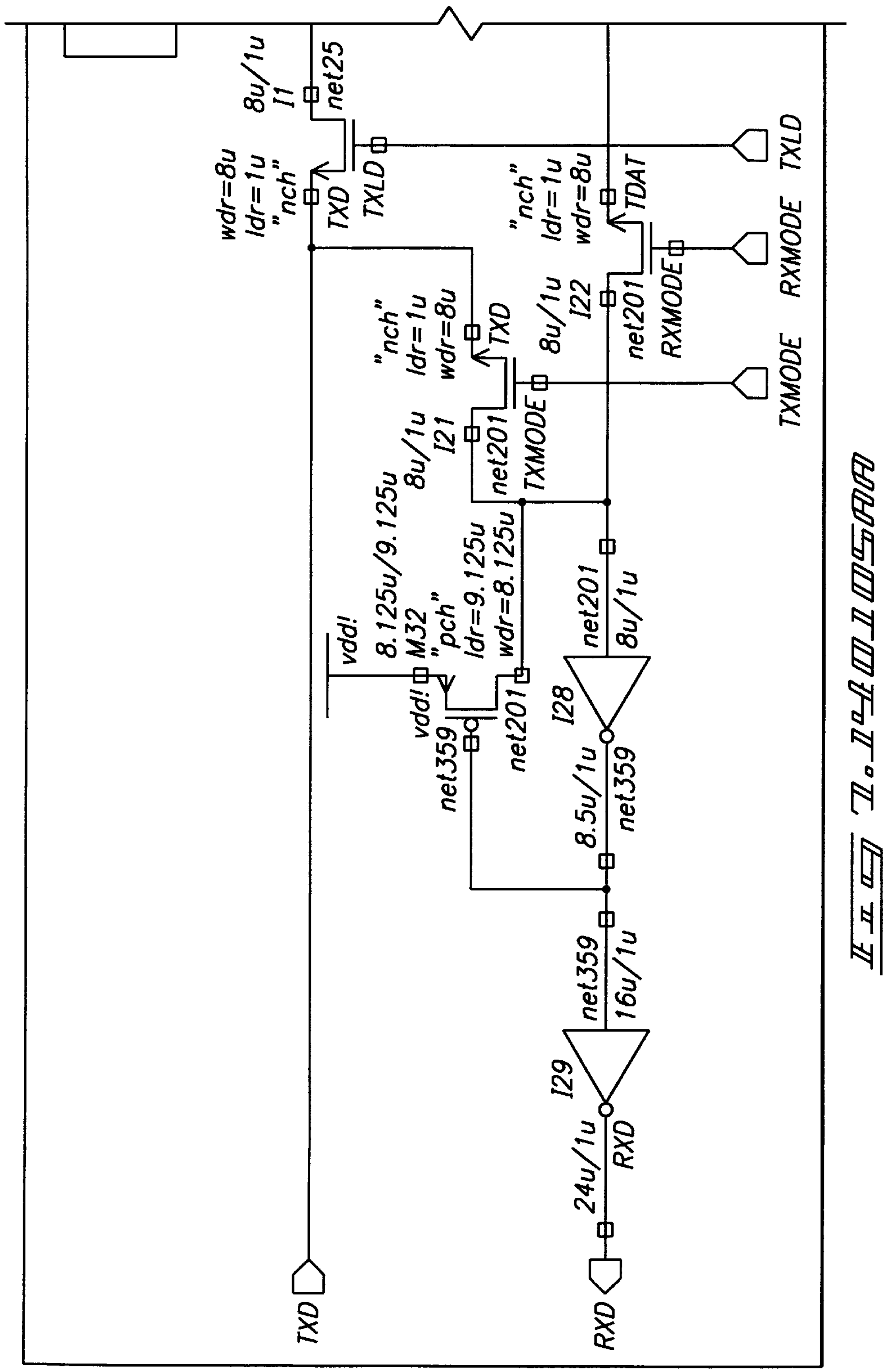
FIG. 7.140105AA

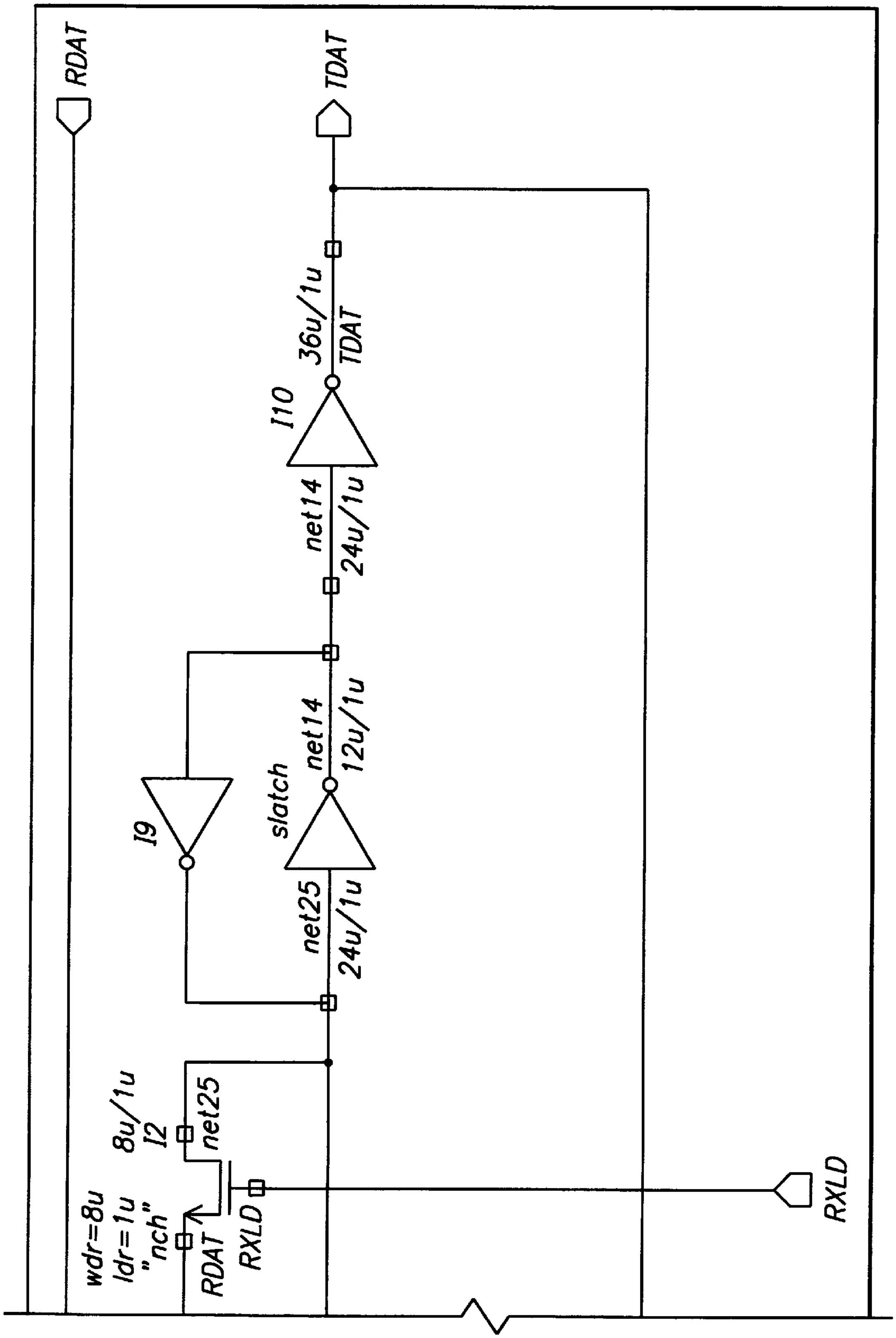
FIG. 7.140105AB

| | | | | | | | | |
|---|---|---|---|---|---|---|---|---|
| | | 7.1402AC | 7.1402AD | 7.1402AE | 7.1402AF | 7.1402AG | 7.1402AH | 7.1402AI |
| 7.1402BA | 7.1402BB | 7.1402BC | 7.1402BD | 7.1402BE | 7.1402BF | 7.1402BG | 7.1402BH | 7.1402BI |
| 7.1402CA | 7.1402CB | 7.1402CC | 7.1402CD | 7.1402CE | 7.1402CF | 7.1402CG | 7.1402CH | 7.1402CI |
| 7.1402DA | 7.1402DB | 7.1402DC | 7.1402DD | 7.1402DE | 7.1402DF | 7.1402DG | 7.1402DH | 7.1402DI |
| 7.1402EA | 7.1402EB | 7.1402EC | 7.1402ED | 7.1402EE | 7.1402EF | 7.1402EG | 7.1402EH | 7.1402EI |

Fig. 7.1402

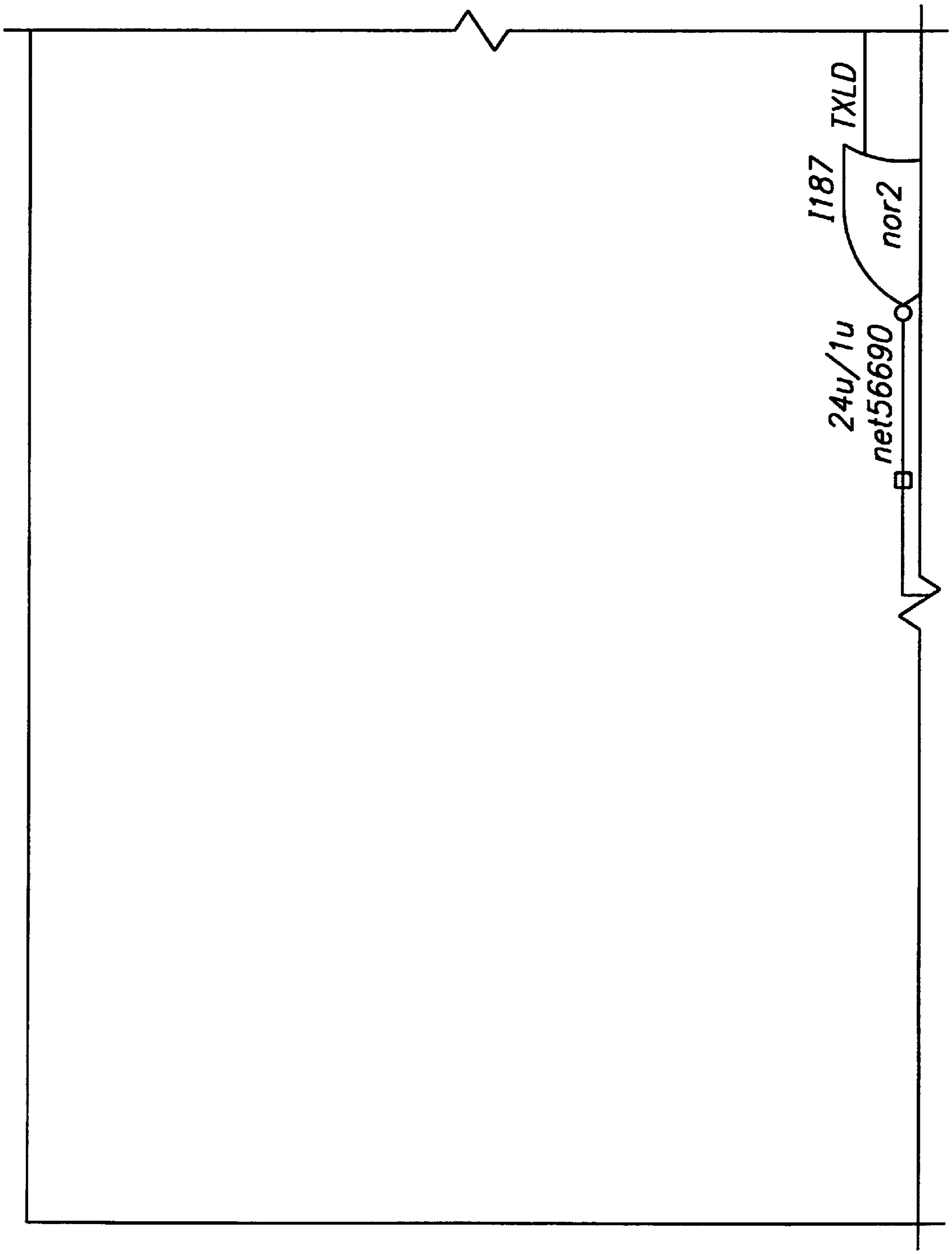
FIG. 7.11402AC

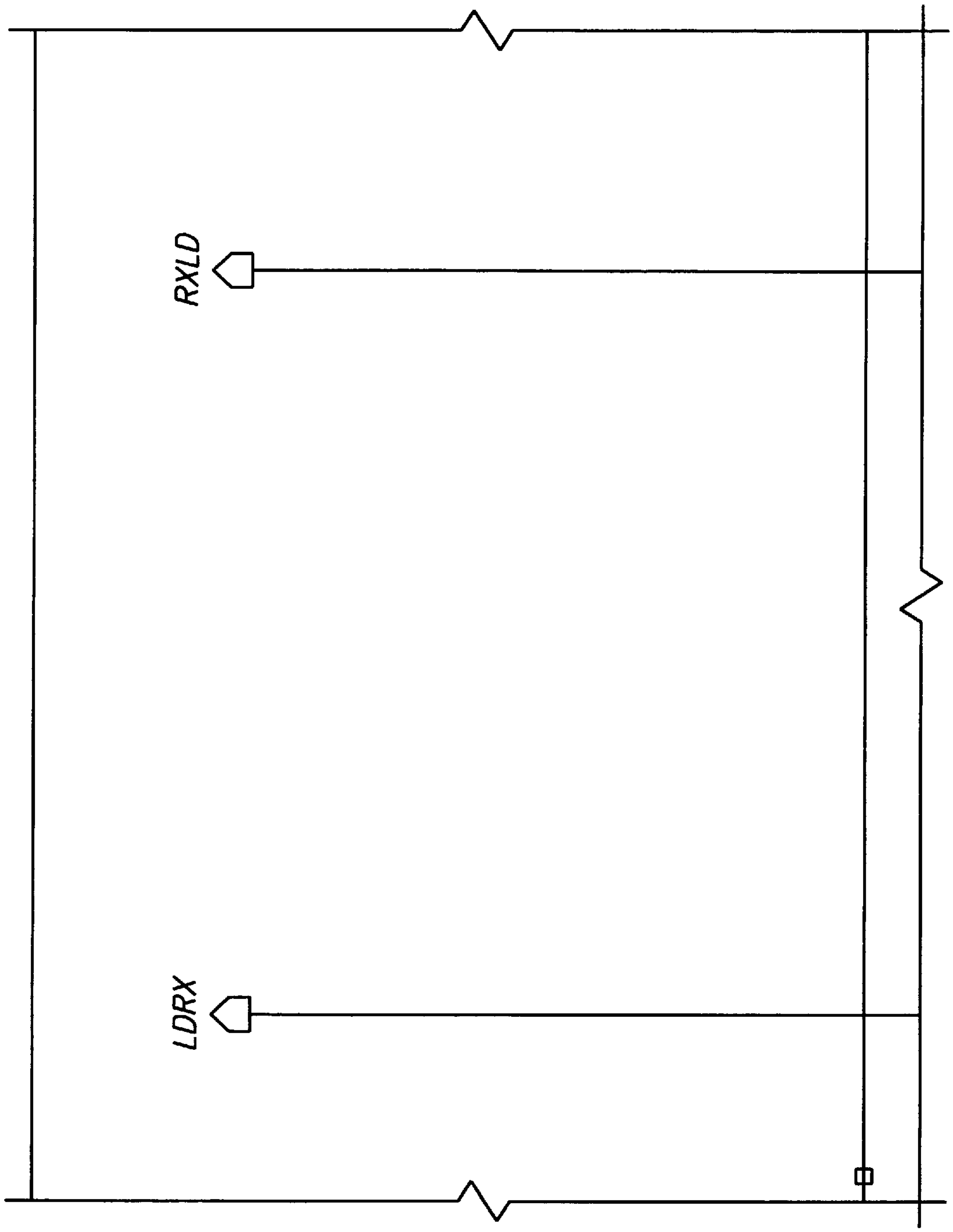
FIG. 7.1402AD

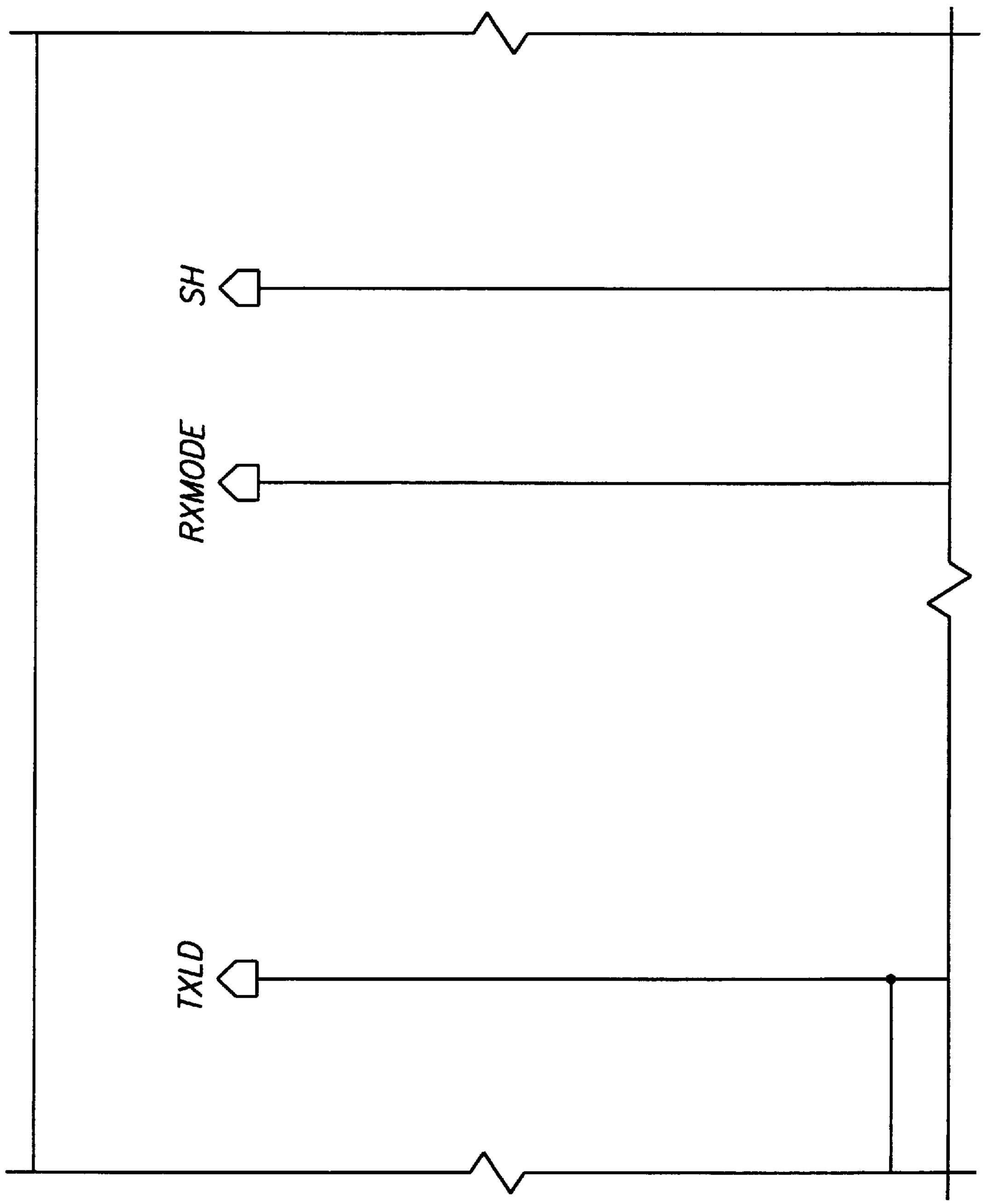
FIG. 7.1402AE

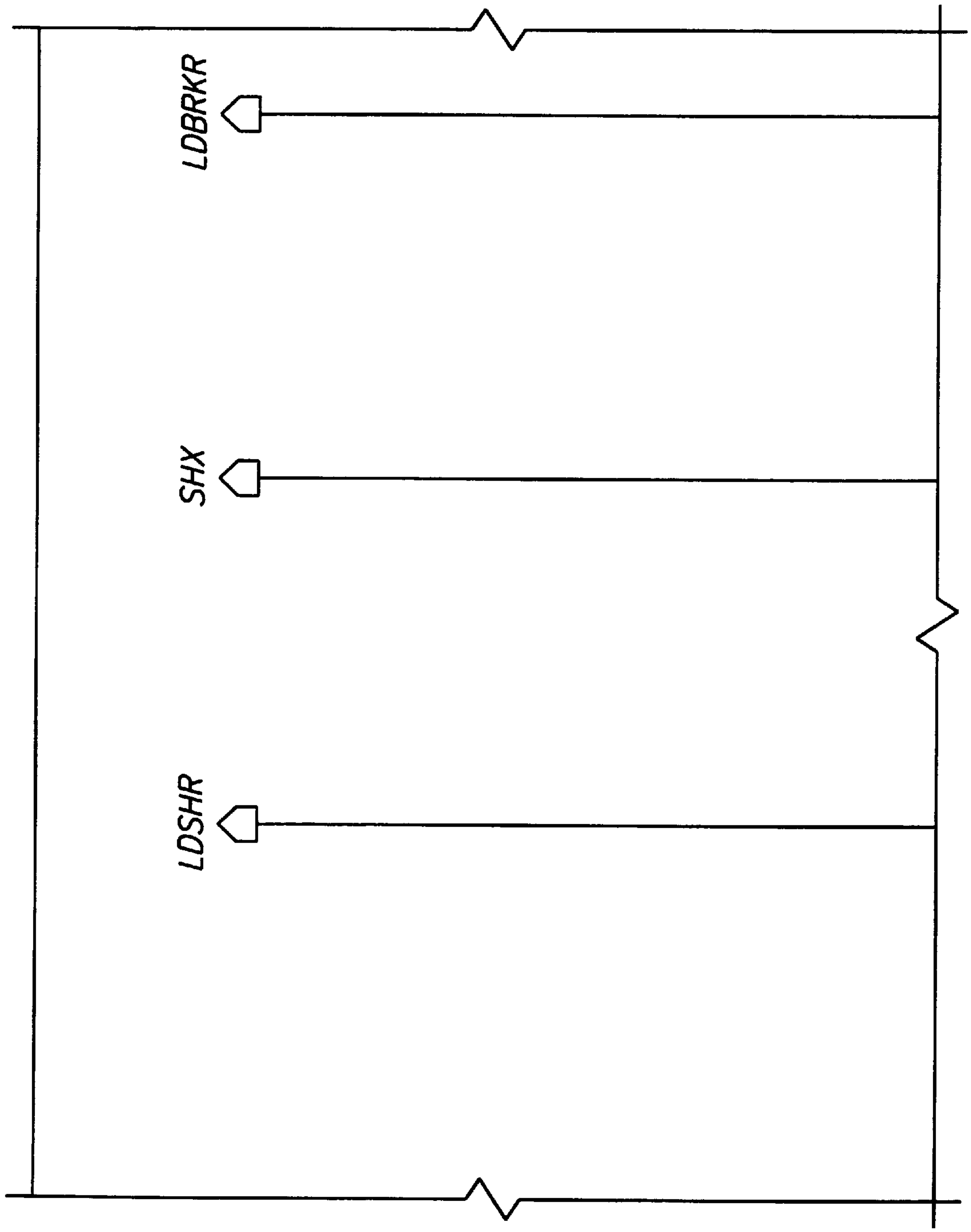
FIG. 7.11.40ZAF

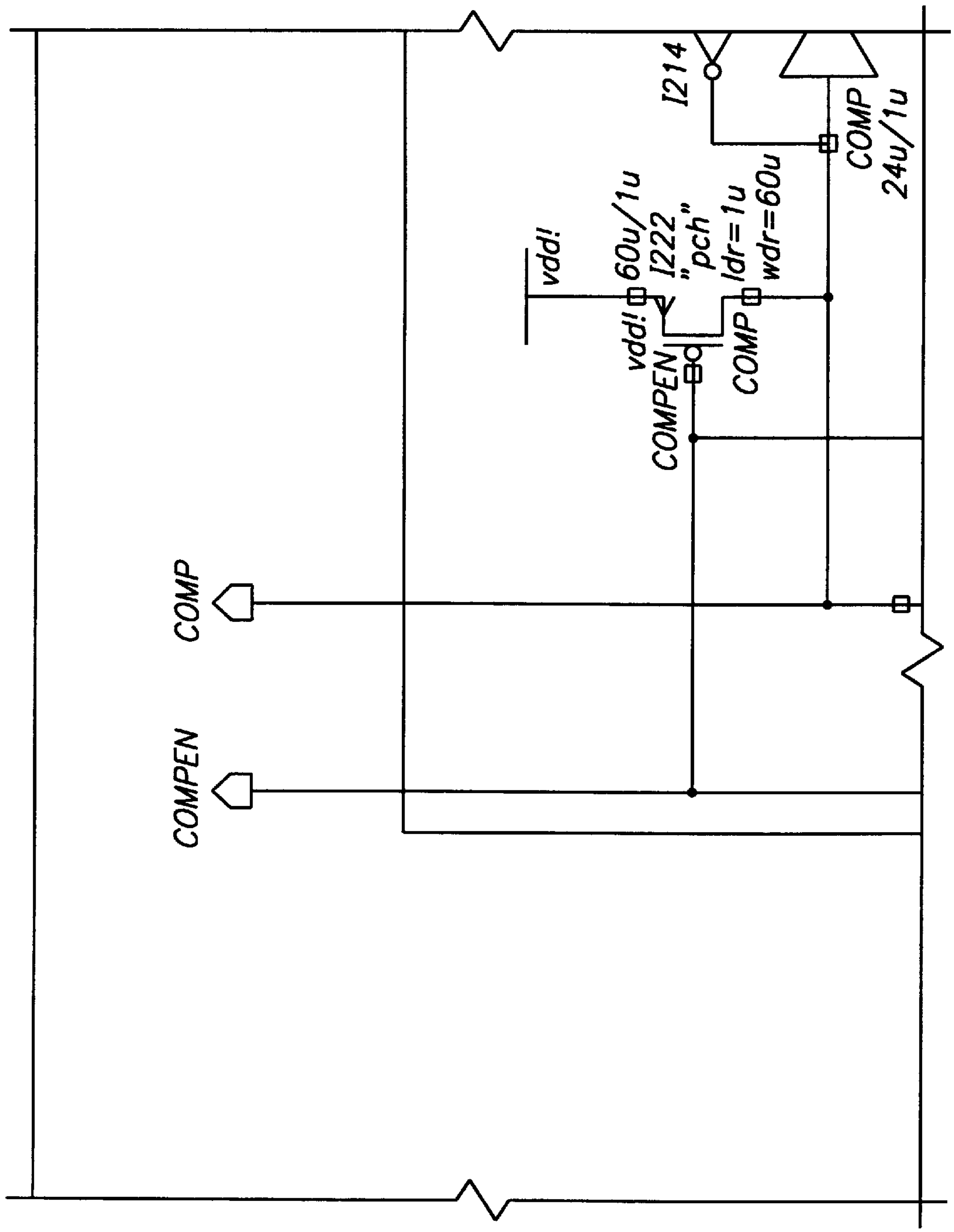
FIG. 7.11402AG

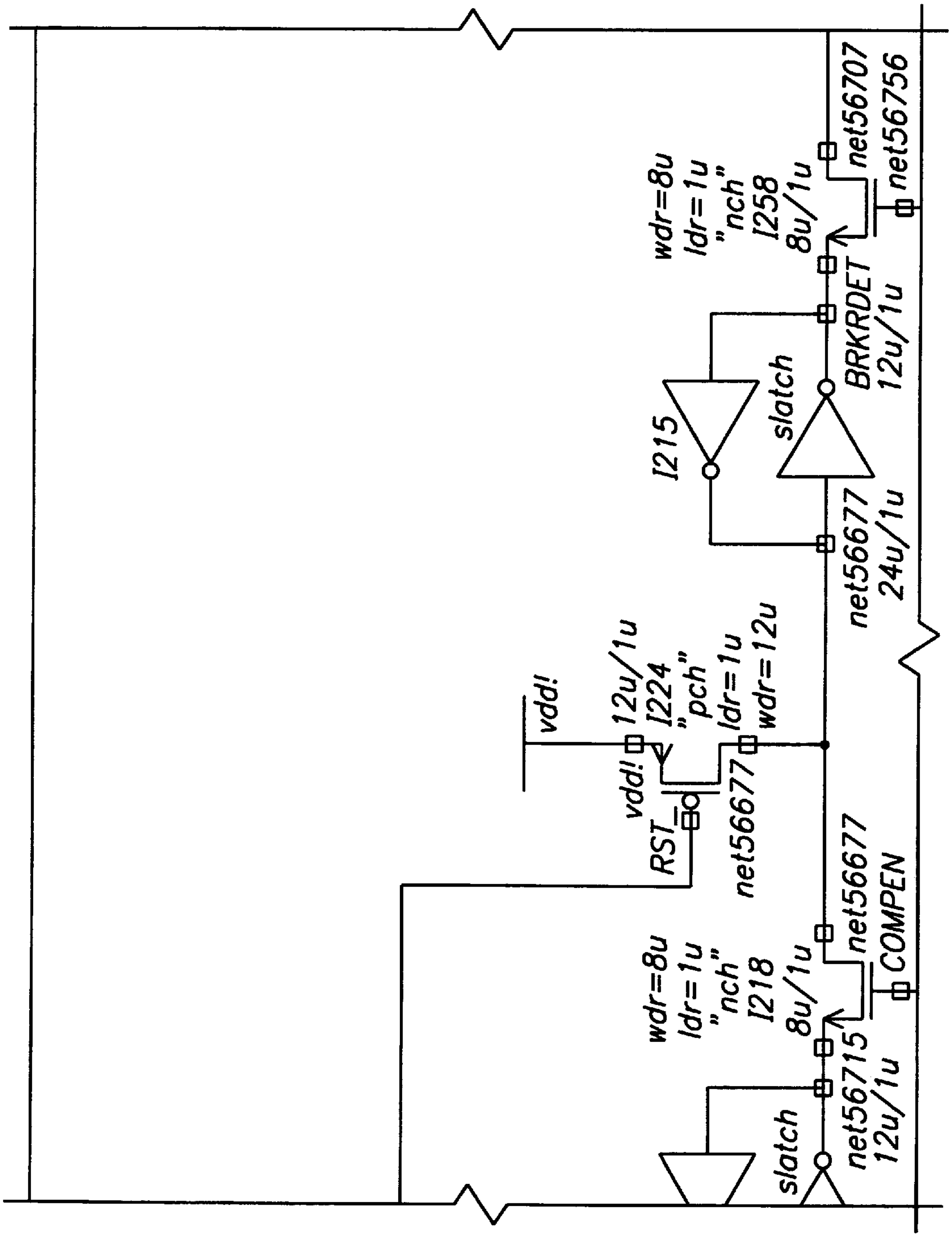
net56707
net56756
wdr=8u
ldr=1u
"nch"
I258
8u/1u
BRKRDET
12u/1u
slatch
I215
net56677
24u/1u
vdd!
12u/1u
I224
"pch"
ldr=1u
wdr=12u
vdd!
RST_
net56677
net56677
COMPEN
wdr=8u
ldr=1u
"nch"
I218
8u/1u
net56715
12u/1u
slatch

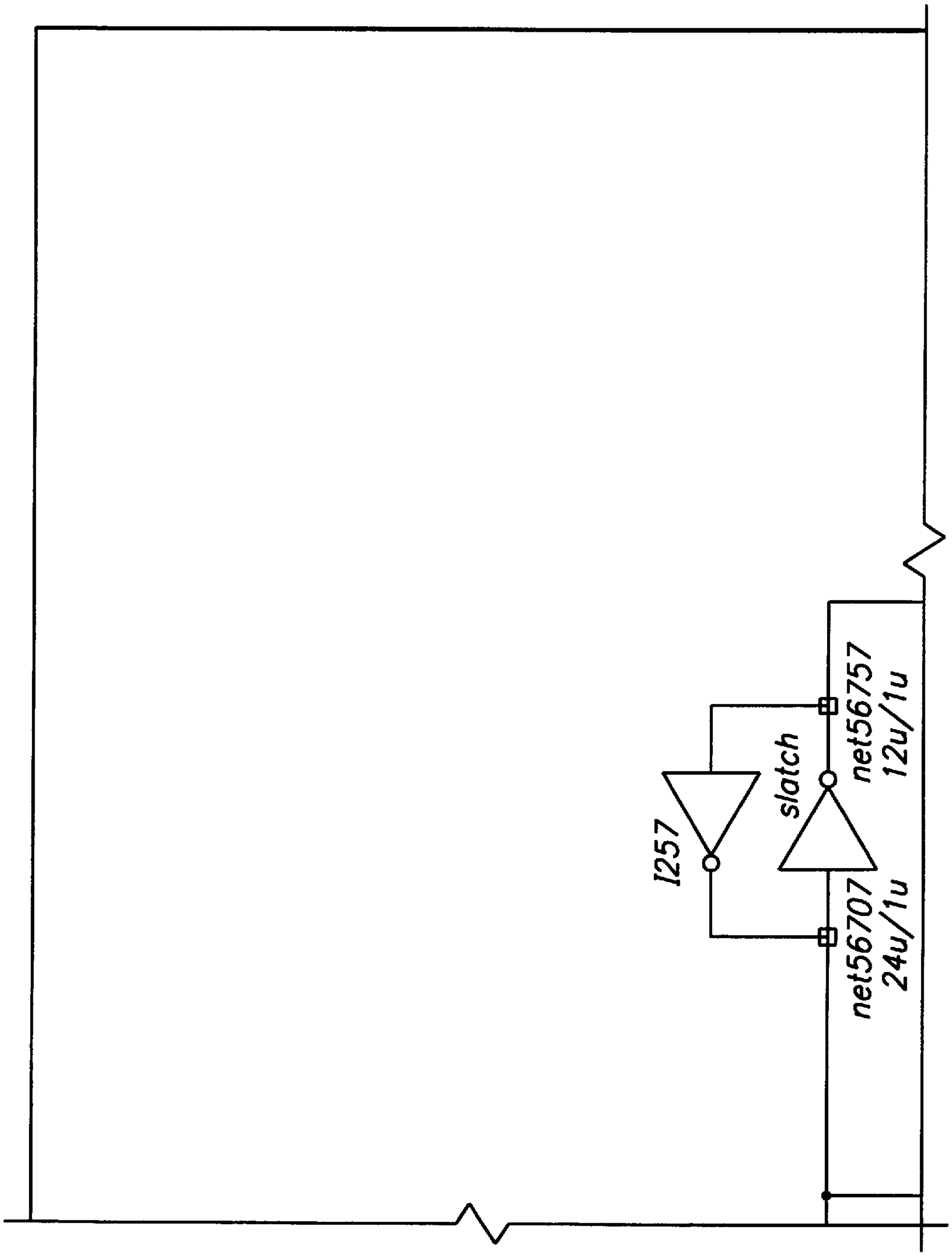
FIG. 7.1402AI

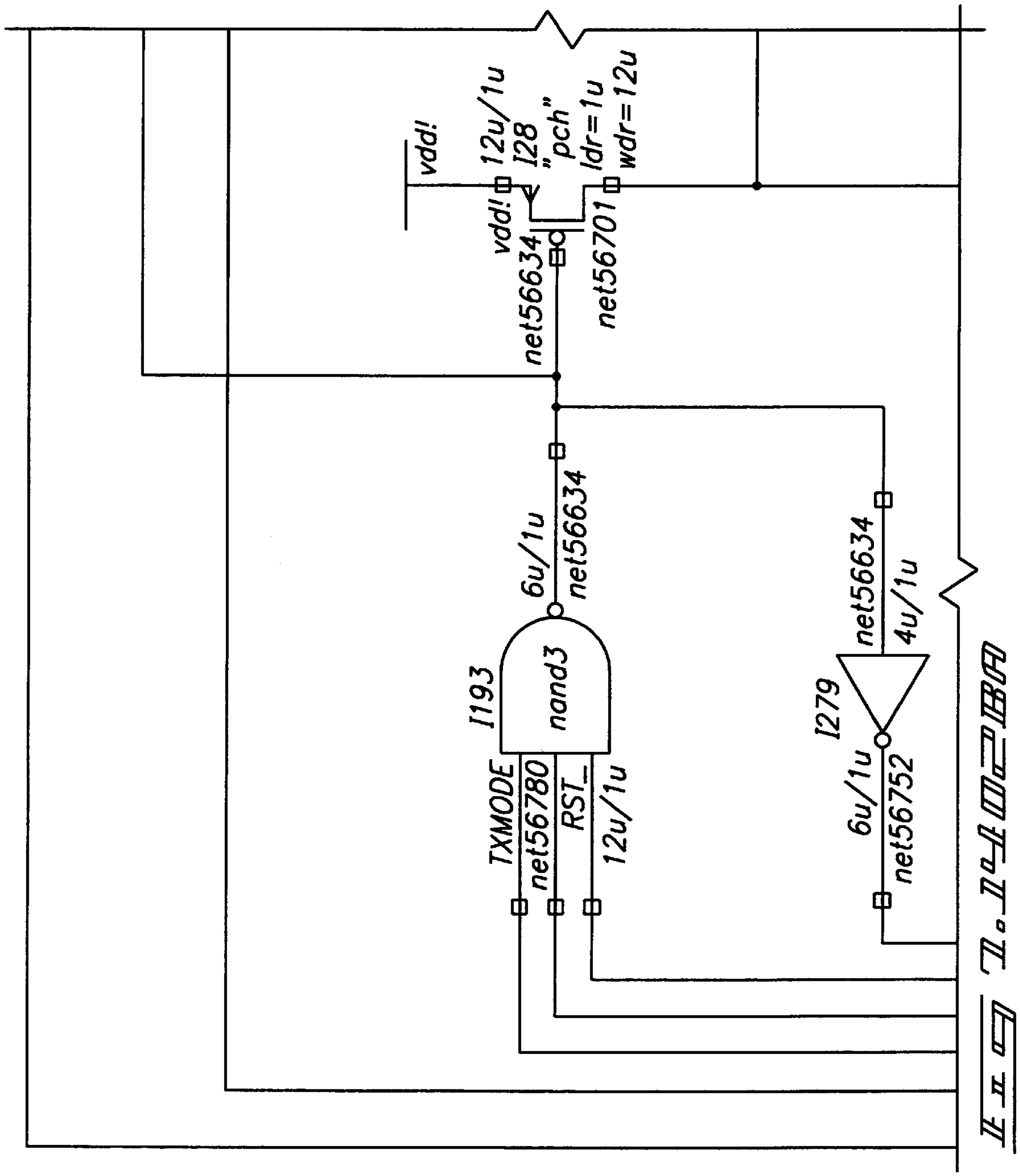
FIG. 7.11402BA

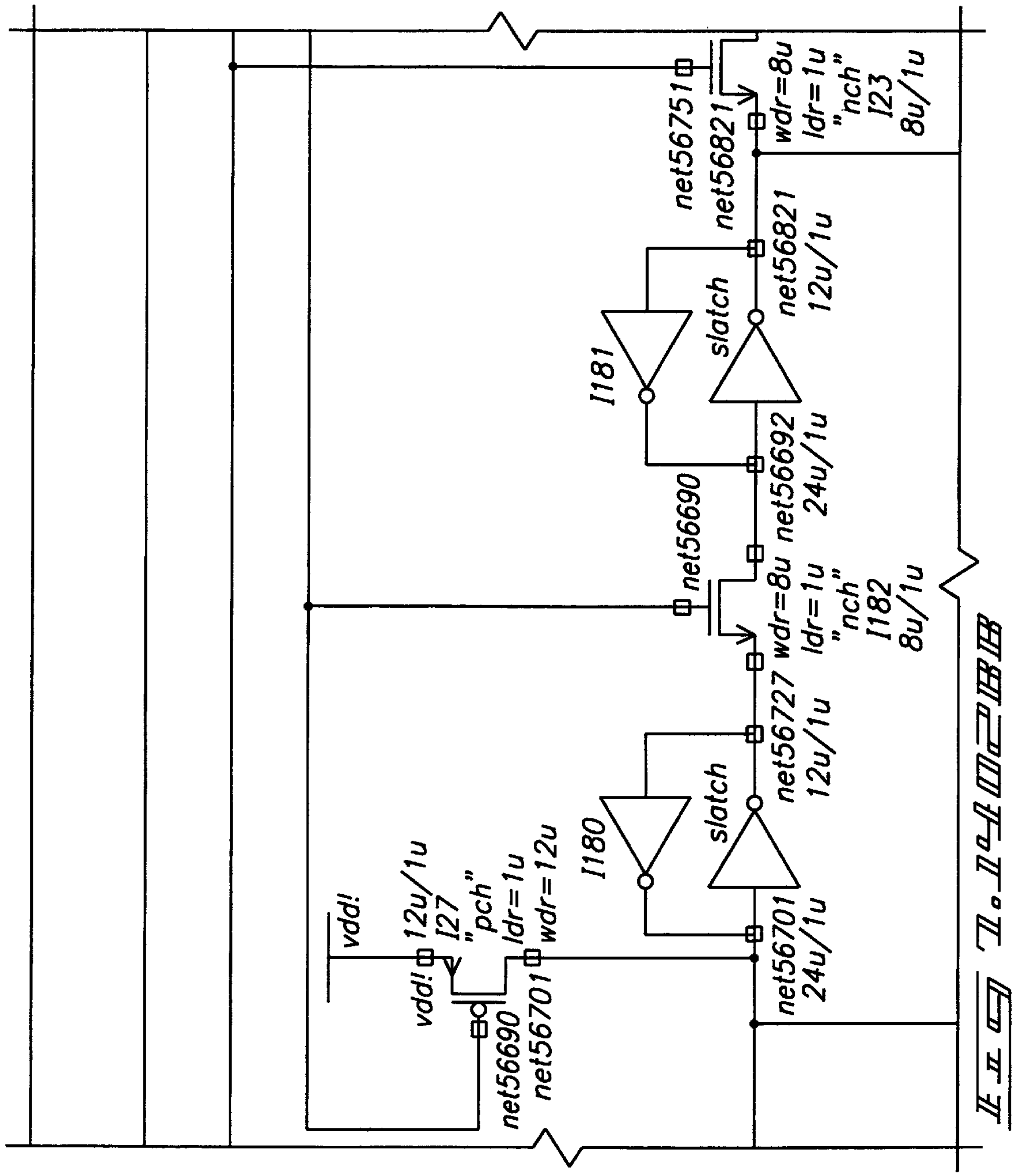
net56751
net56821
wdr=8u
ldr=1u
"nch"
I23
8u/1u
net56821
12u/1u
slatch
I181
net56692
24u/1u
net56690
wdr=8u
ldr=1u
"nch"
I182
8u/1u
net56727
12u/1u
slatch
I180
net56701
24u/1u
vdd!
12u/1u
I27
"pch"
ldr=1u
wdr=12u
vdd!
net56690
net56701

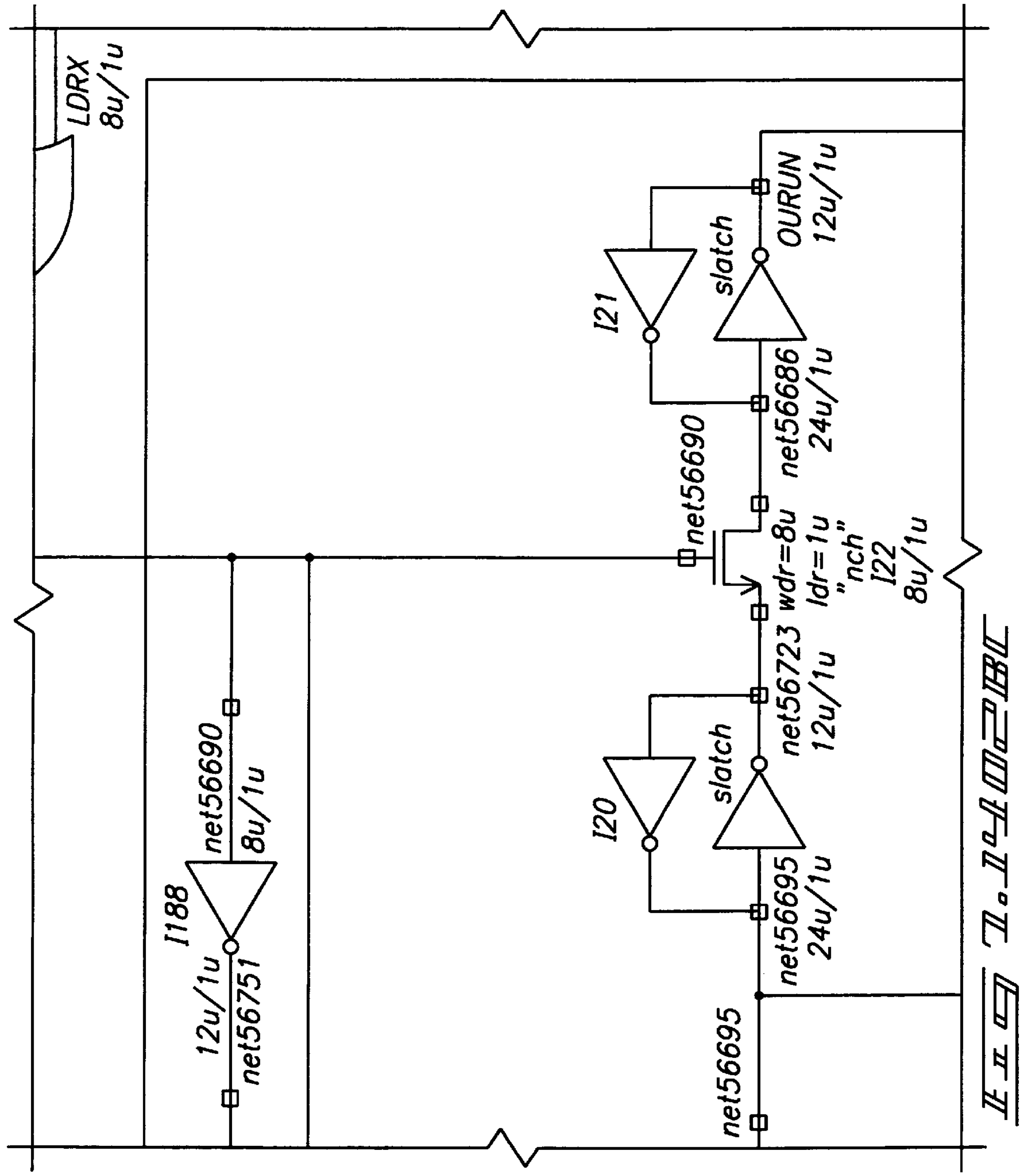
Fig. 7.1402BC

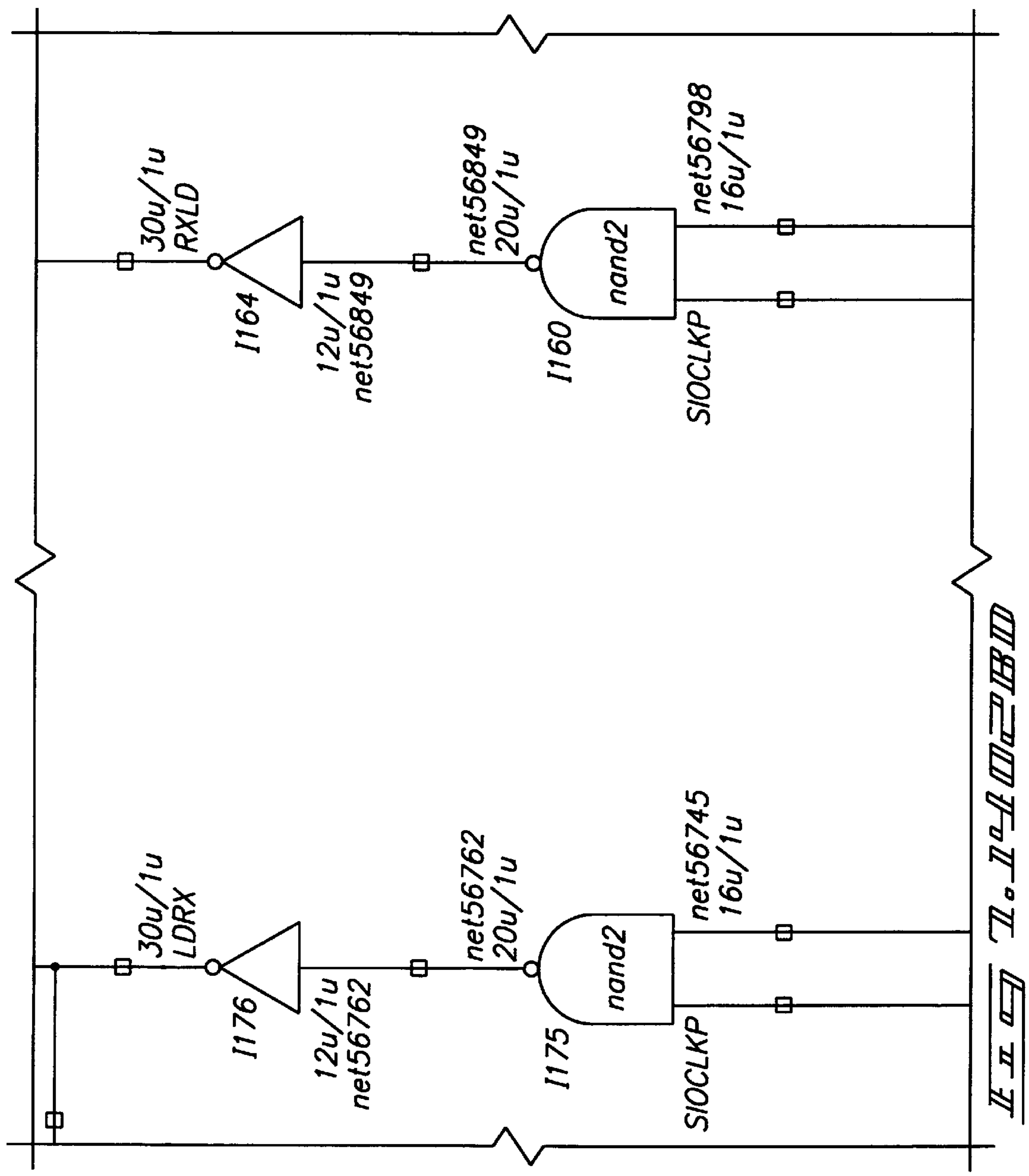
FIG. 7.14O2BD

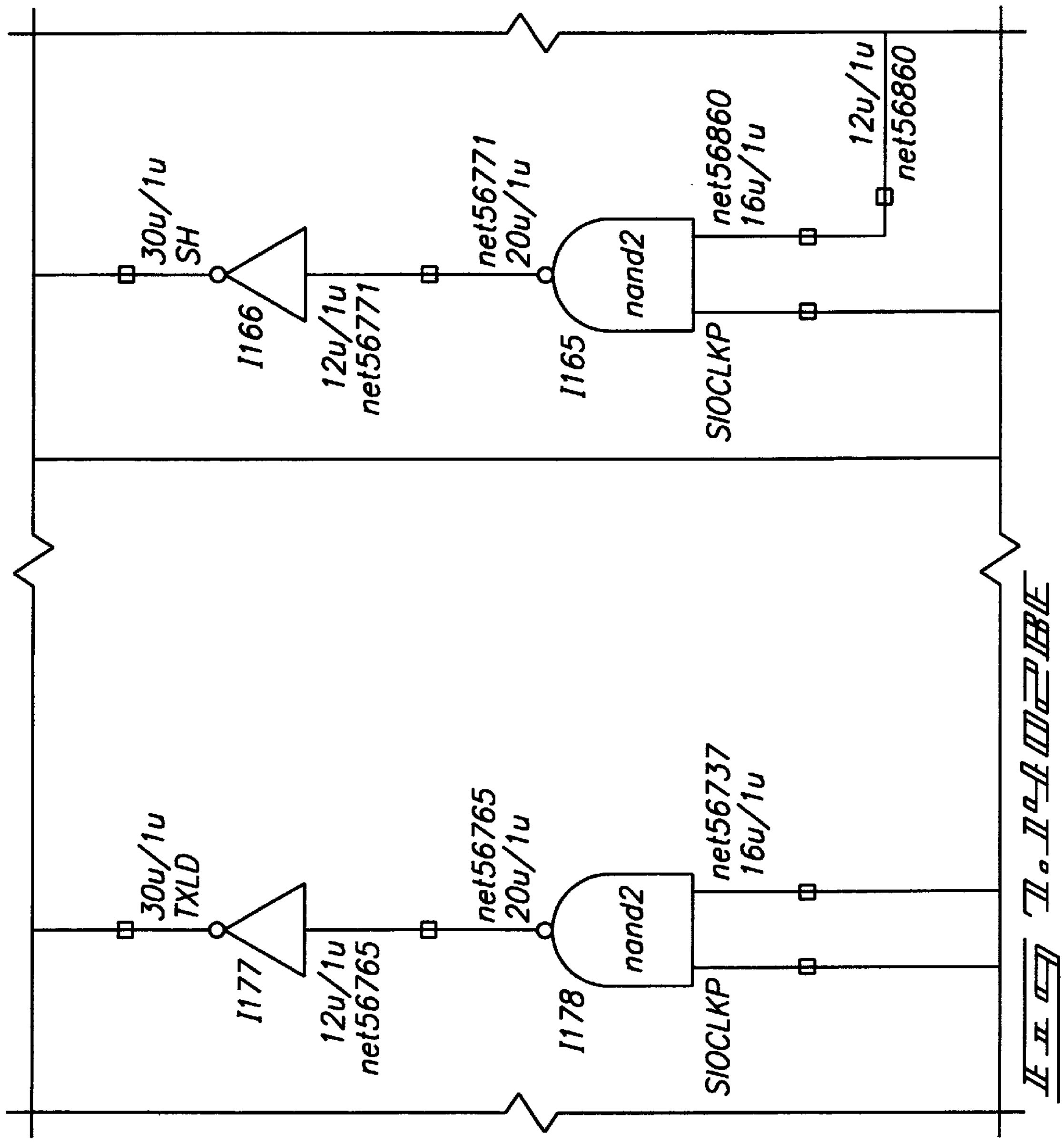
30u/1u
SH
I166
12u/1u
net56771
net56771
20u/1u
I165
nand2
net56860
16u/1u
12u/1u
net56860
SIOCLKP
30u/1u
TXLD
I177
12u/1u
net56765
net56765
20u/1u
I178
nand2
net56737
16u/1u
SIOCLKP

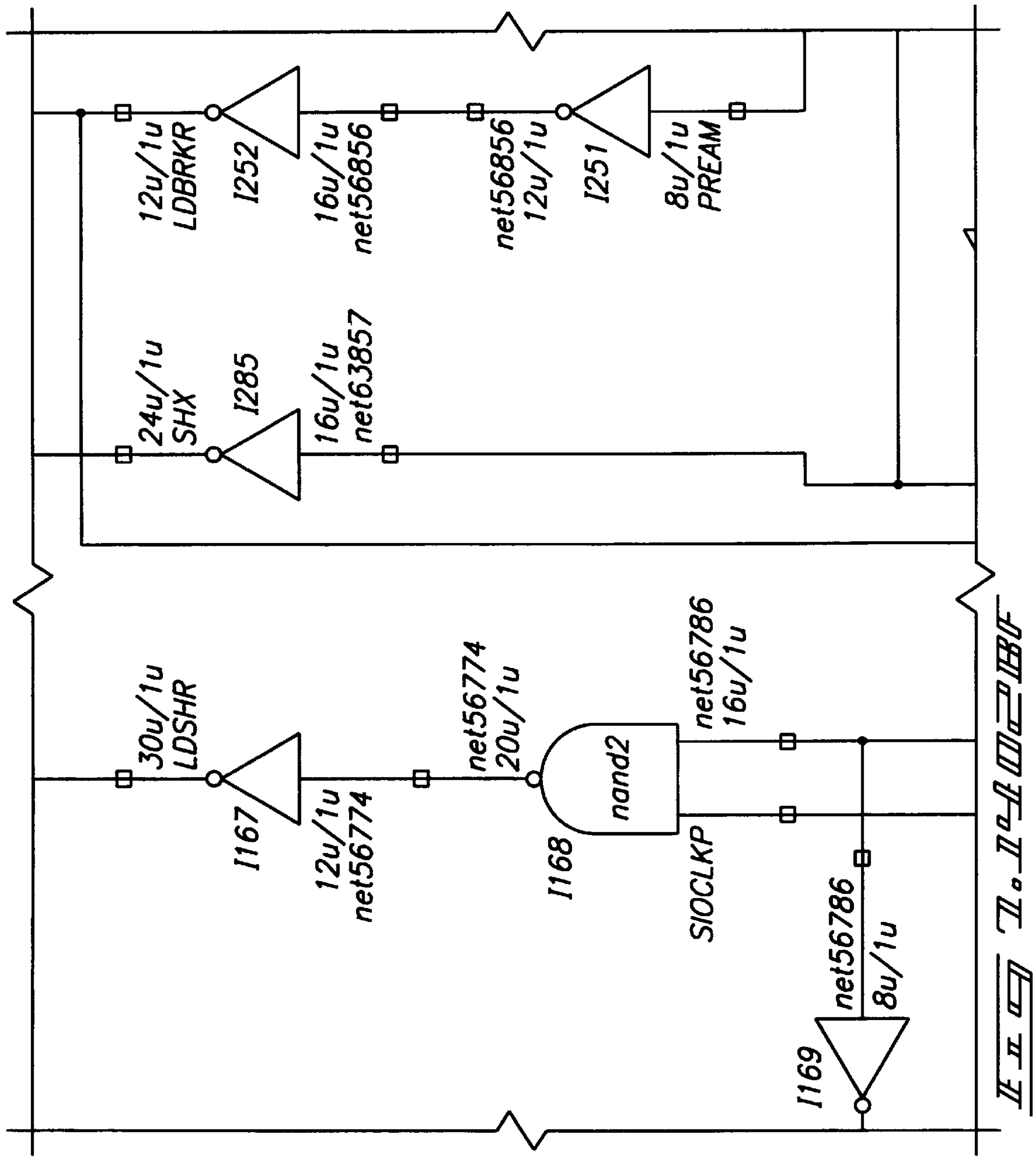
FIG. 7.140BF

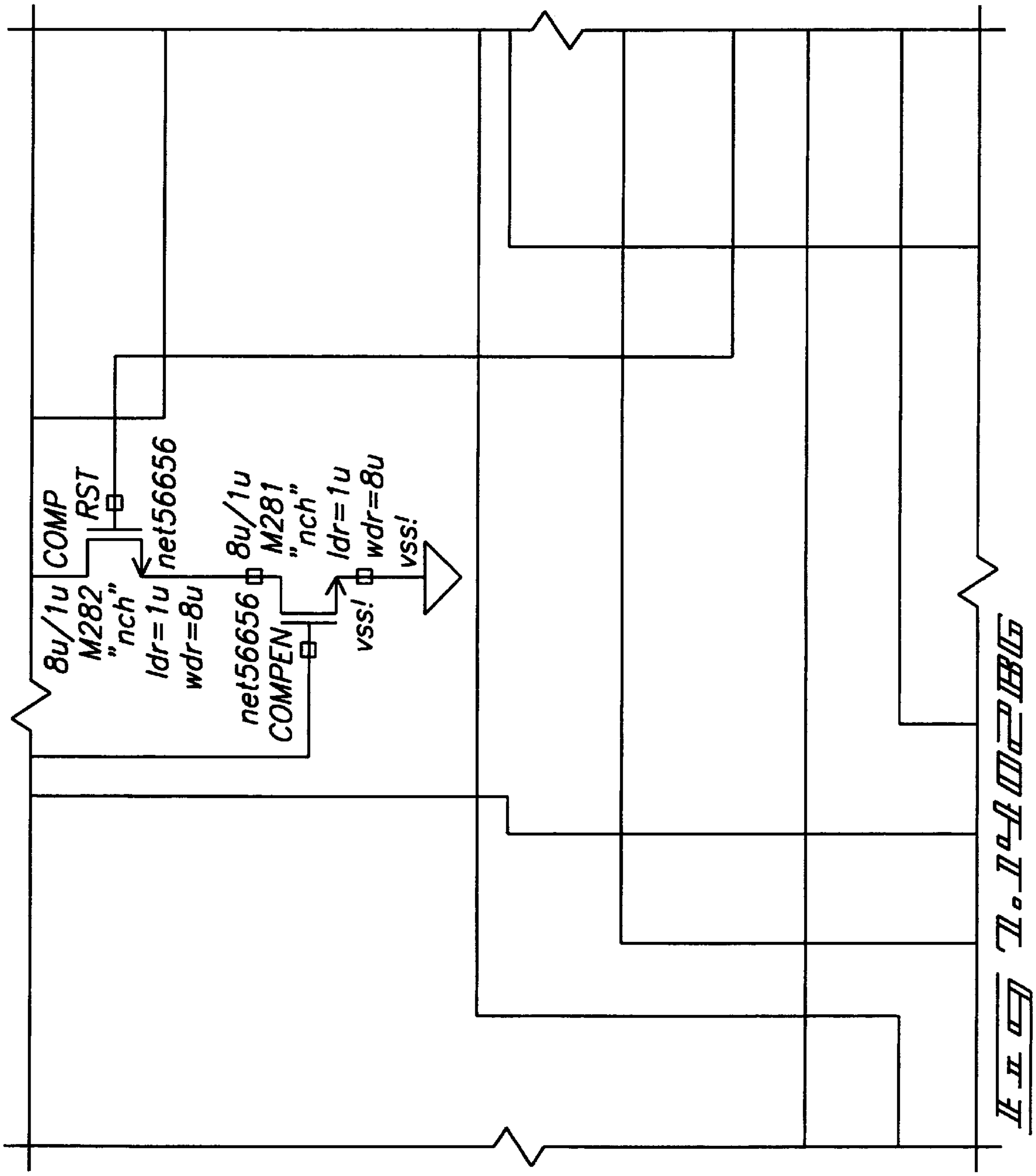
FIG. 7.140ZBG

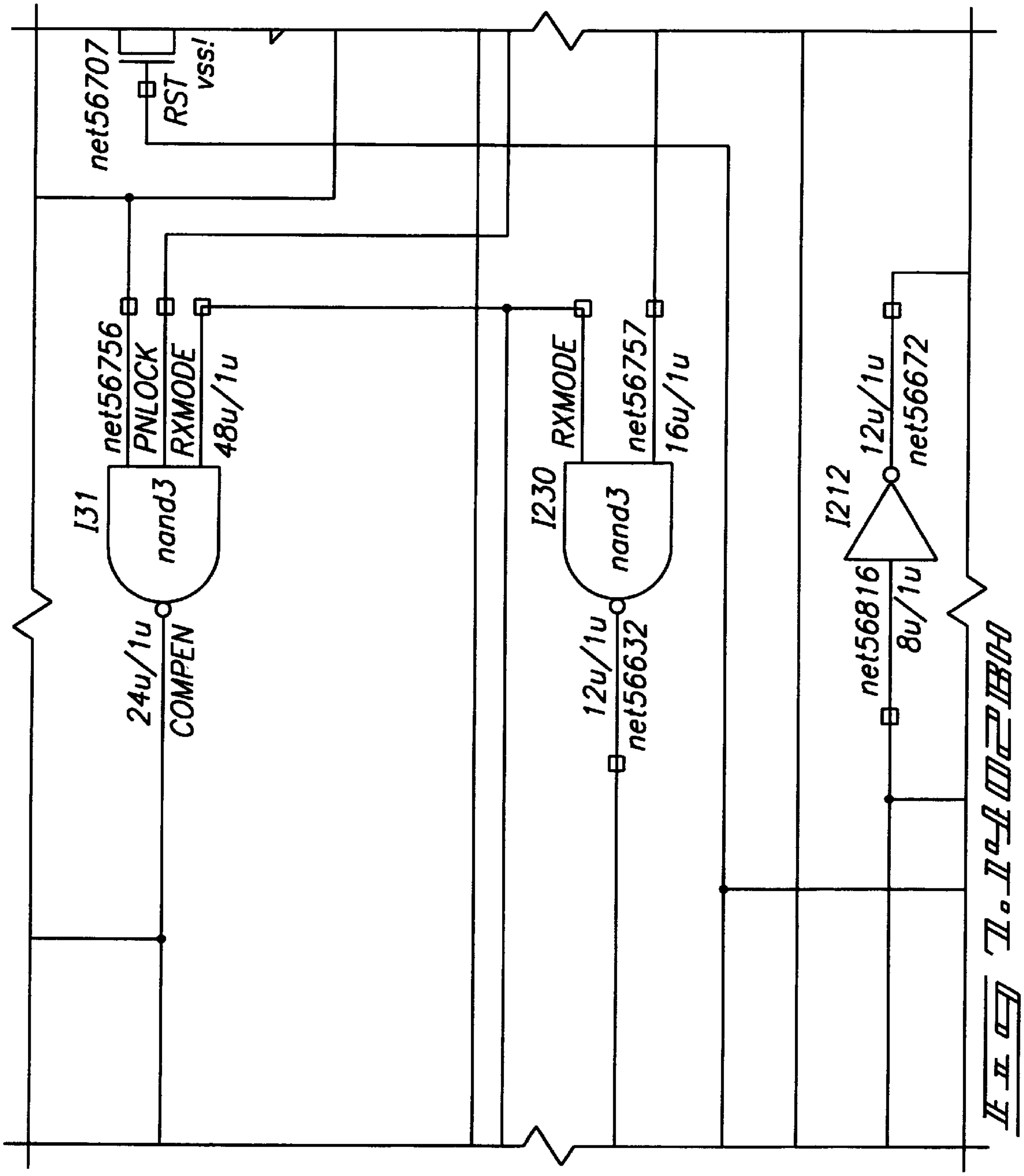
net56707
RST
vss!
net56756
PNLOCK
RXMODE
48u/1u
I31
nand3
24u/1u
COMPEN
RXMODE
net56757
16u/1u
I230
nand3
12u/1u
net56632
12u/1u
net56672
I212
net56816
8u/1u

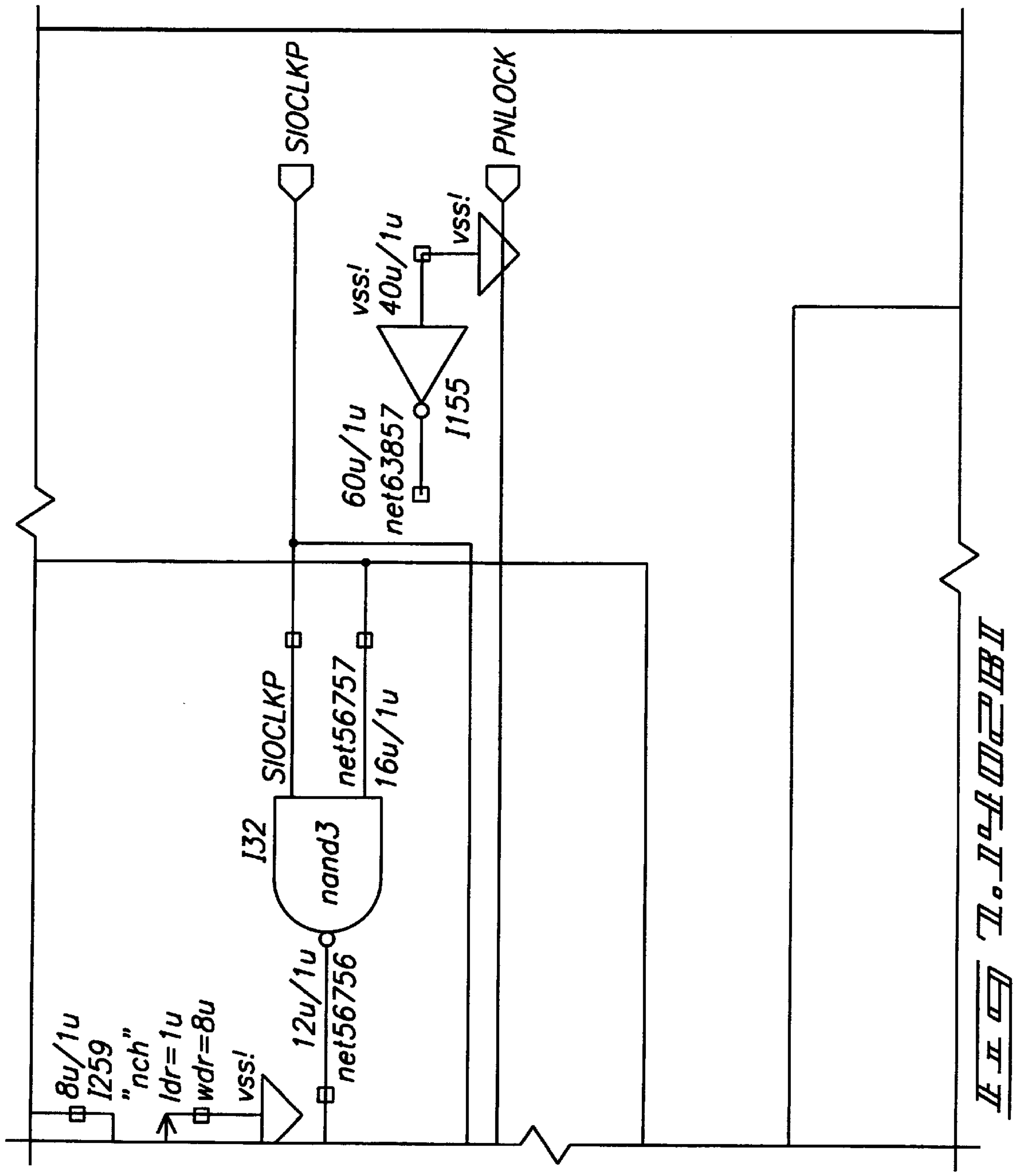
FIG. 7.1402B

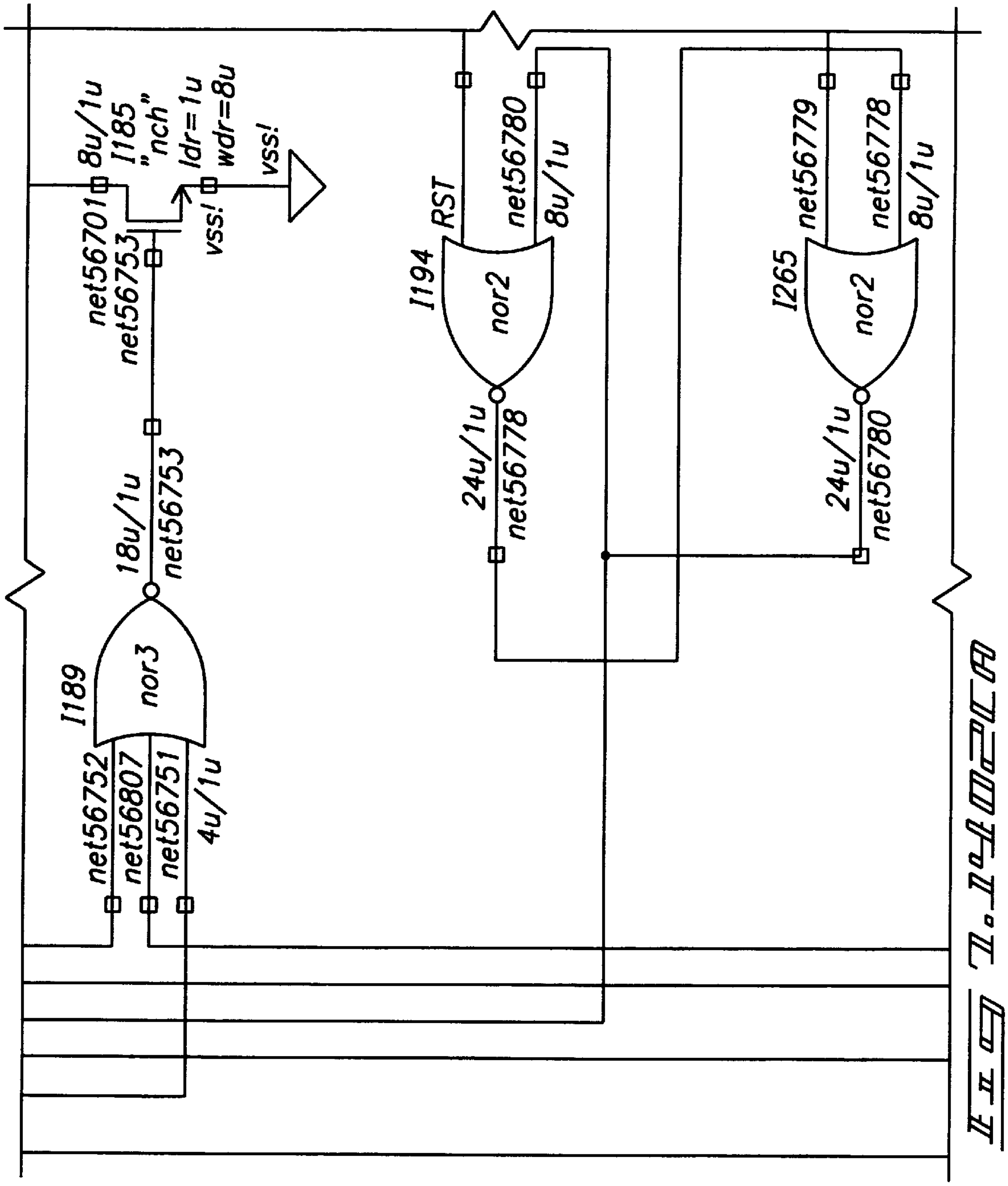
FIG. 11.1402CA

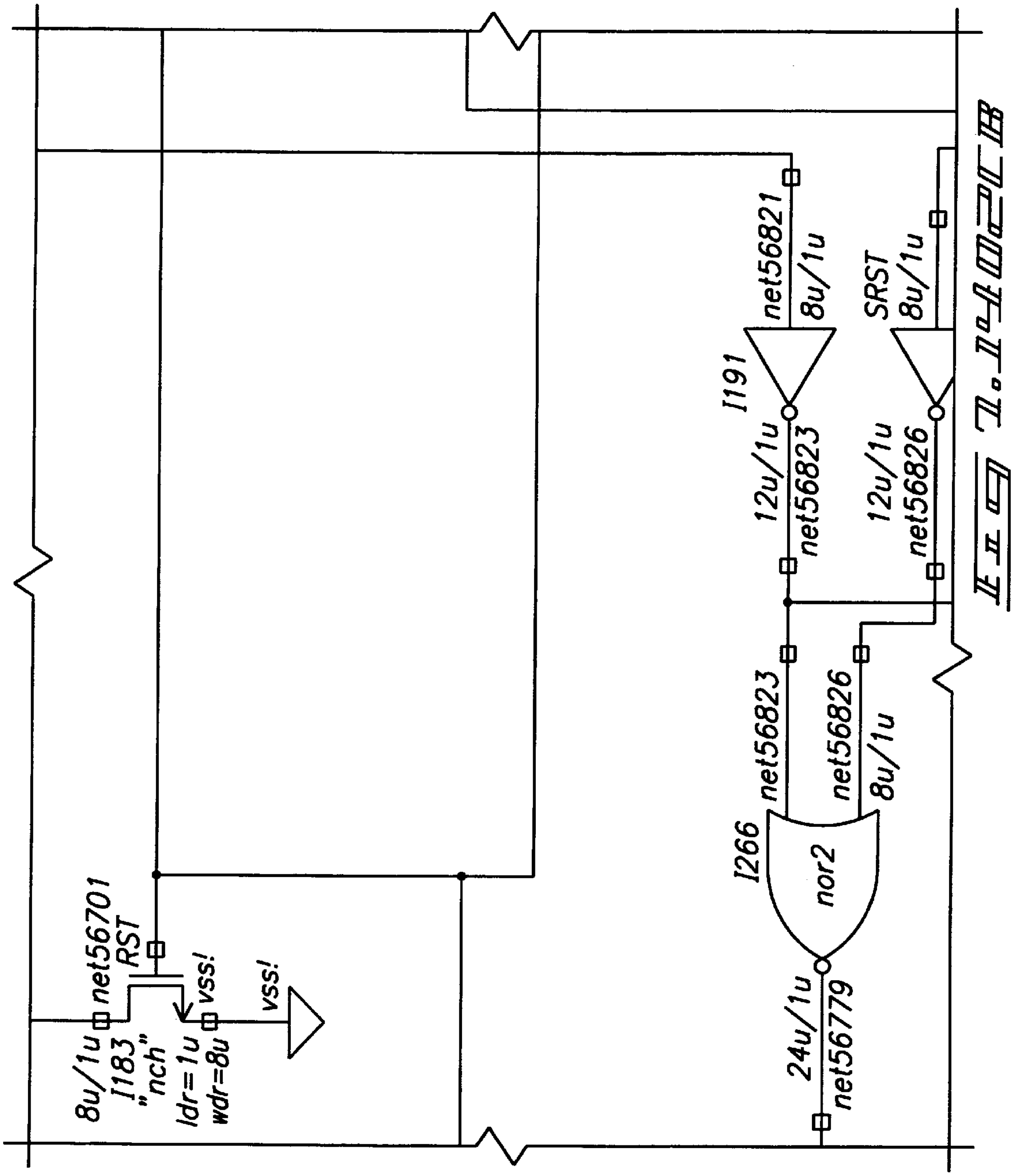
net56821
8u/1u
I191
12u/1u
net56823
SRST
8u/1u
12u/1u
net56826
net56823
net56826
8u/1u
I266
nor2
24u/1u
net56779
net56701
RST
vss!
vss!
8u/1u
I183
"nch"
ldr=1u
wdr=8u

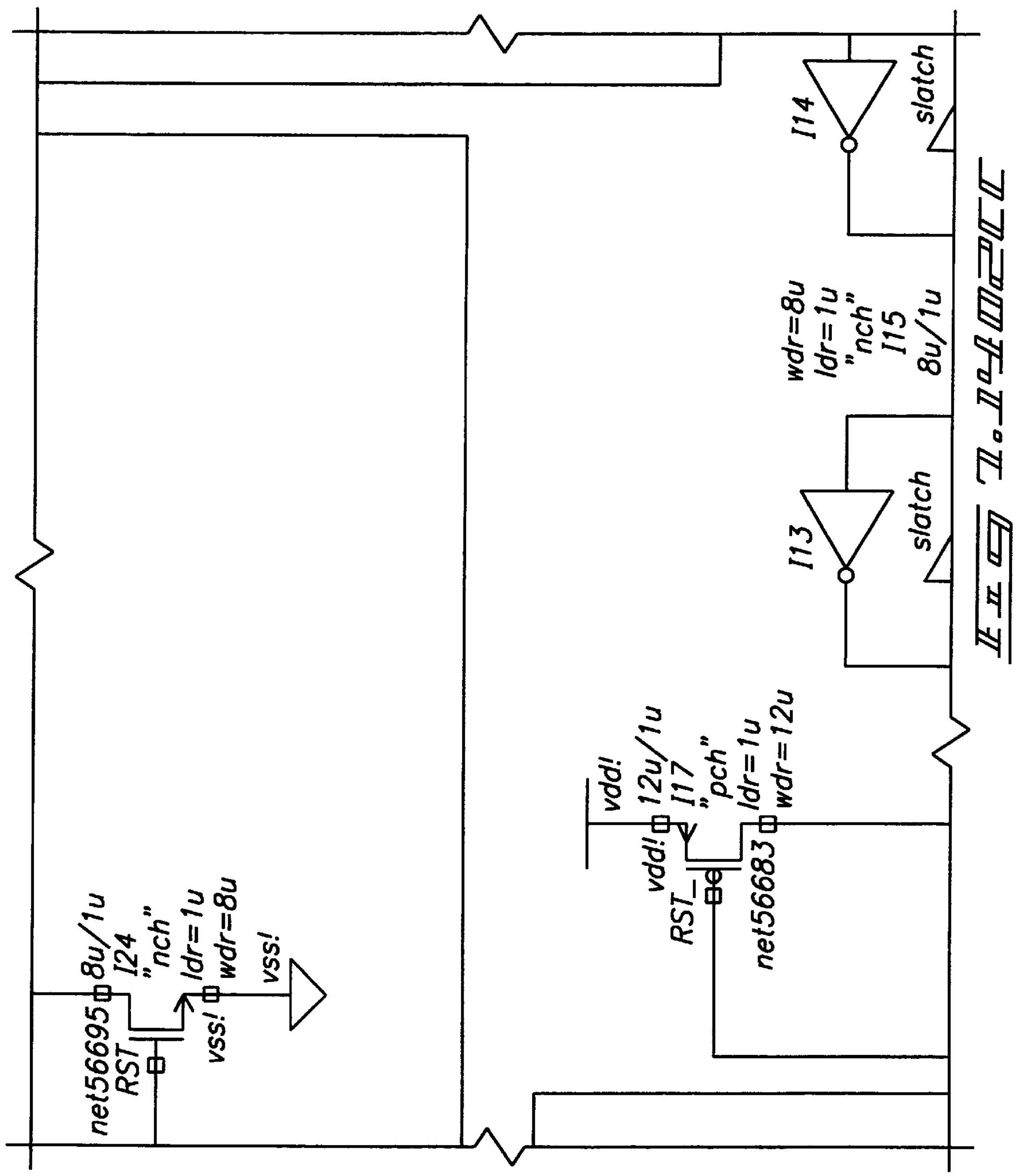
Fig. 7.1402CC

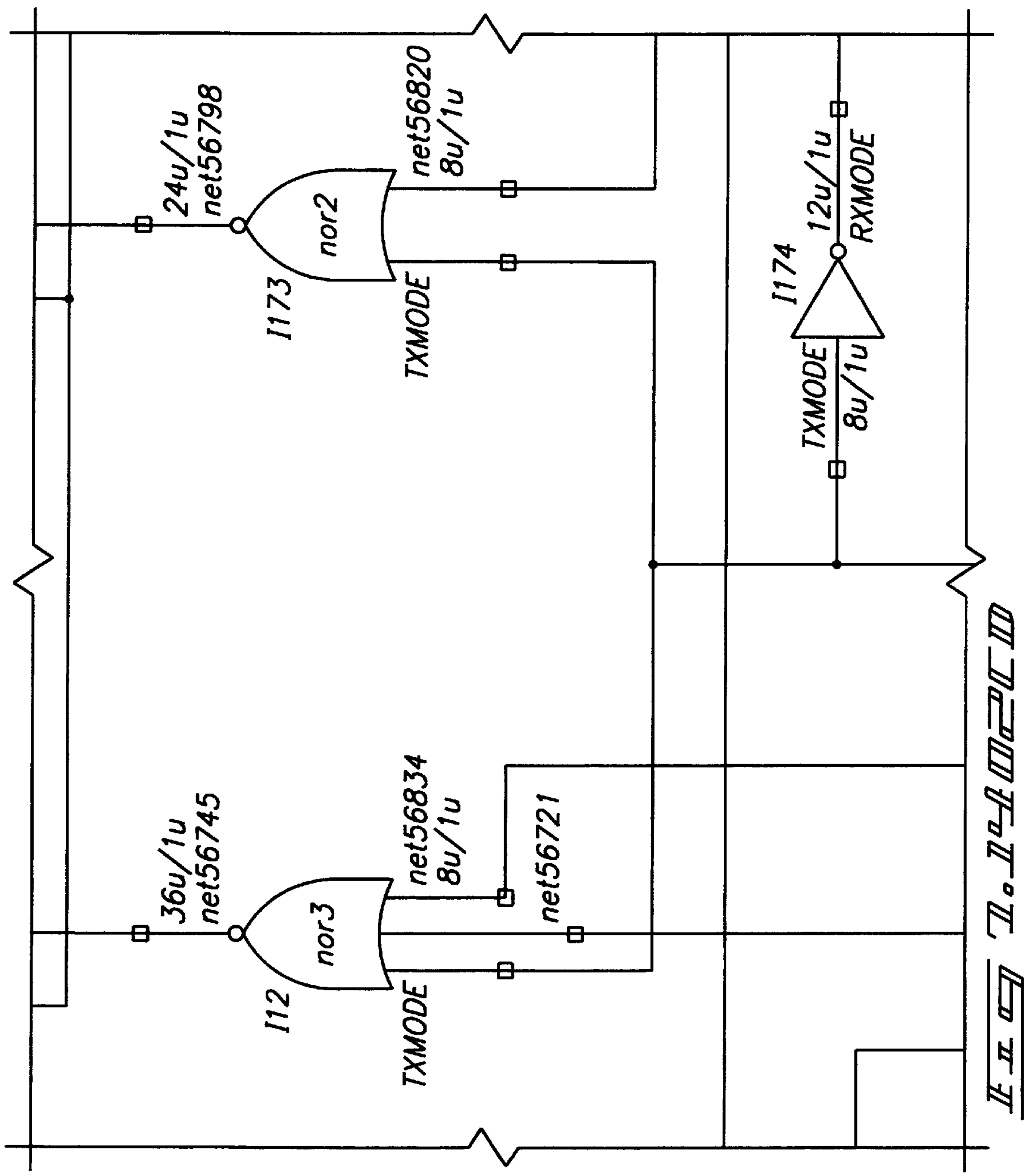
FIG. 7.14.021D

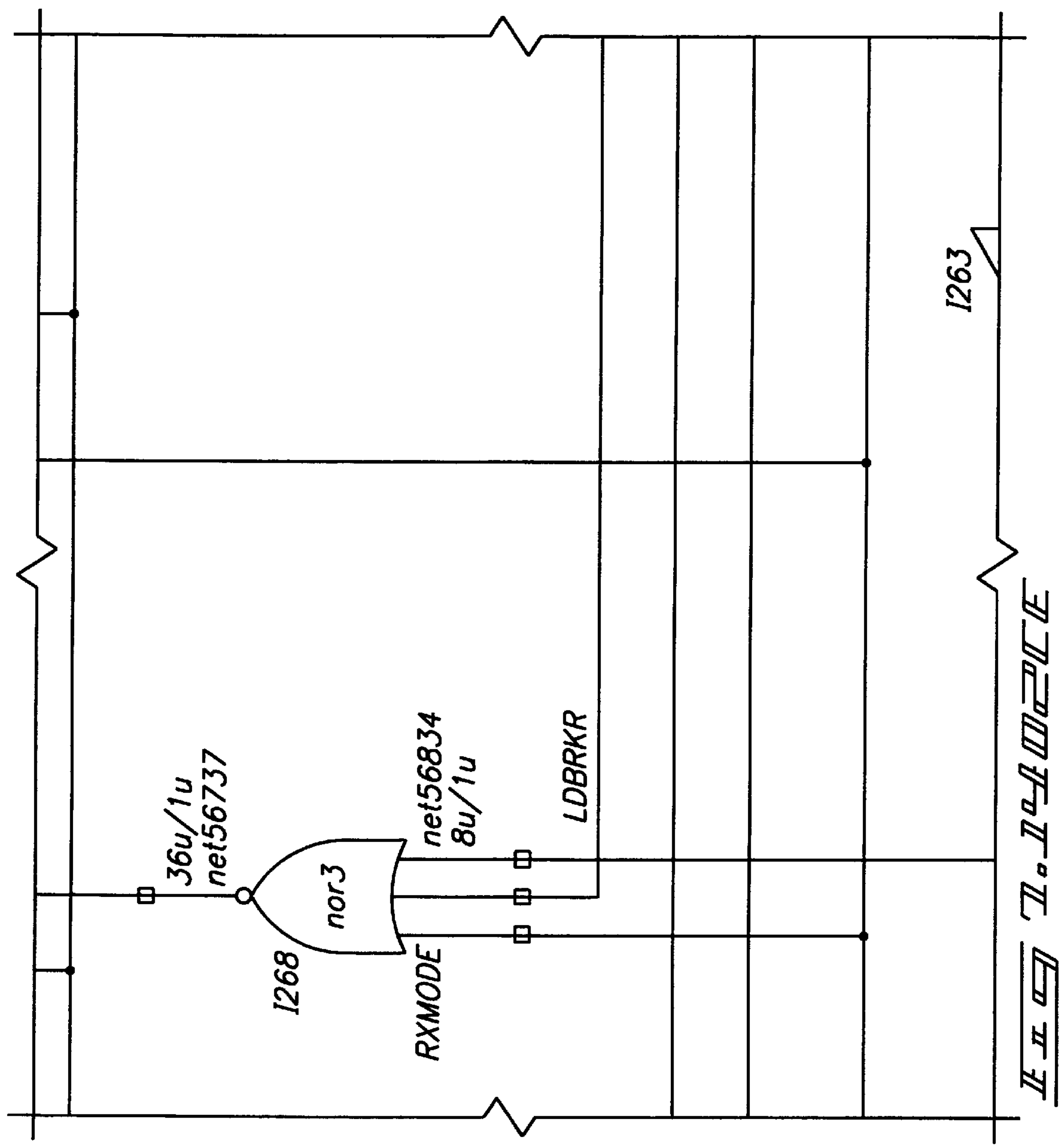
Fig. 7.140ZCE

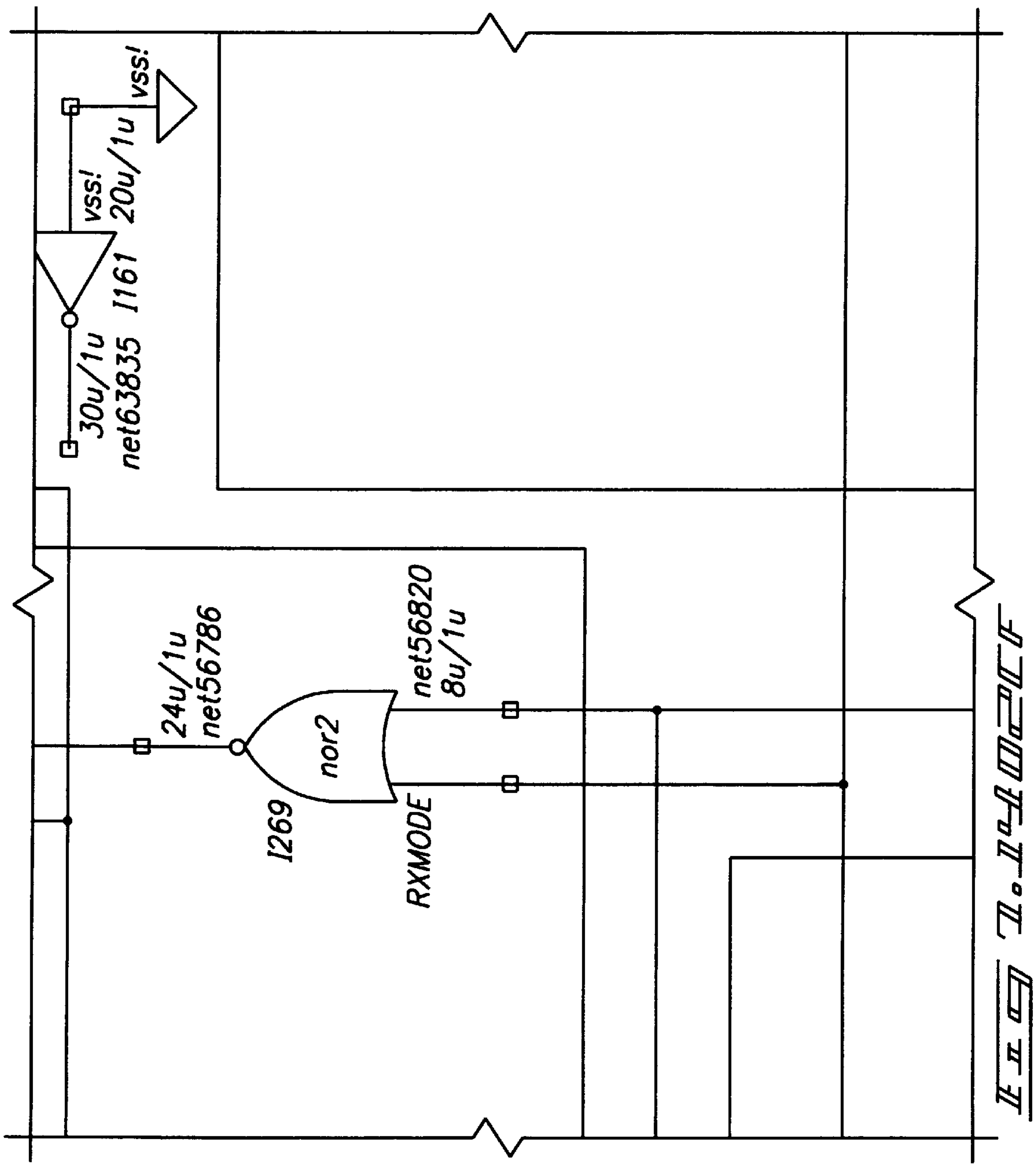
Fig. 7.114O2CF

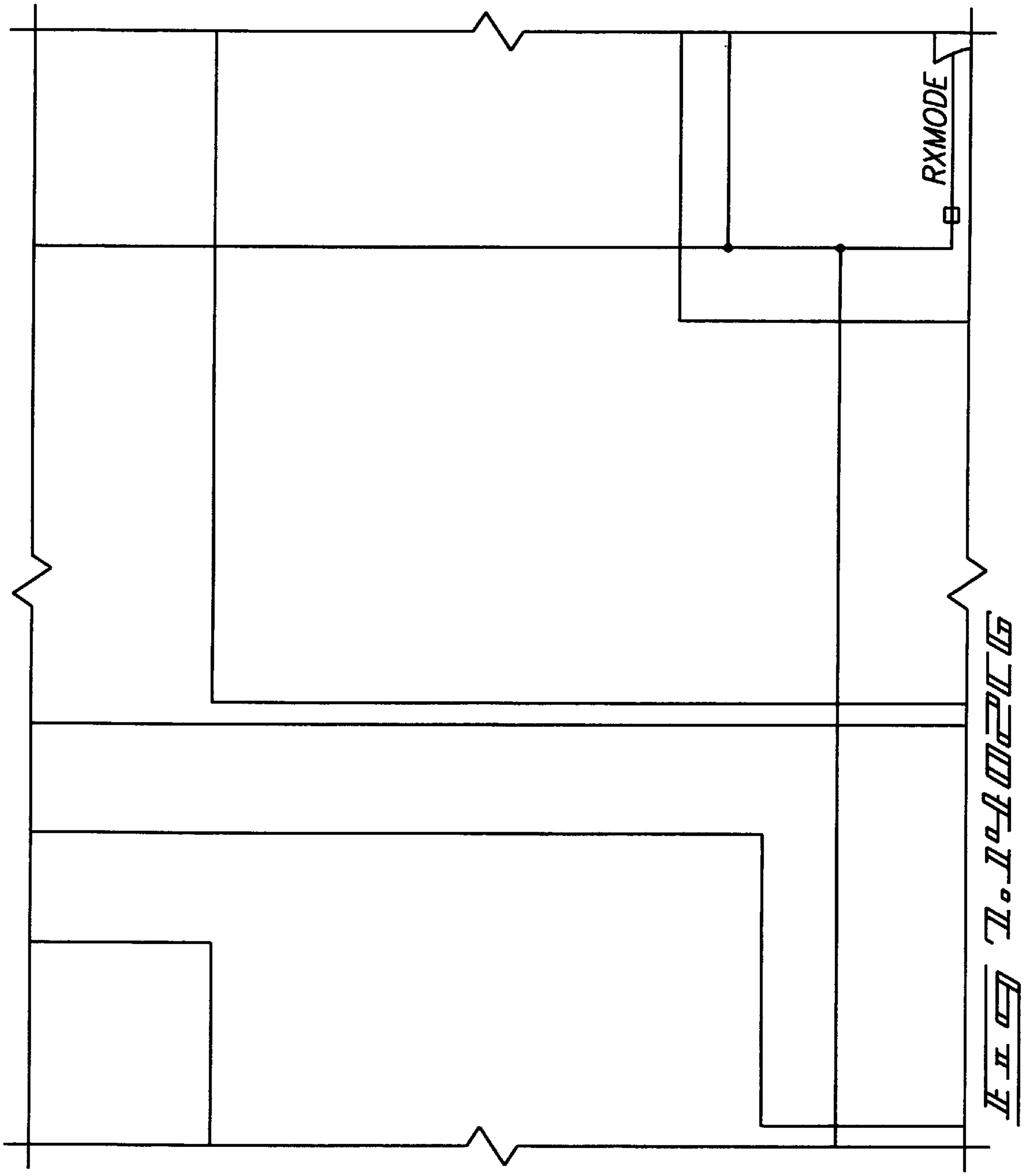
FIG. 7L.114DZG

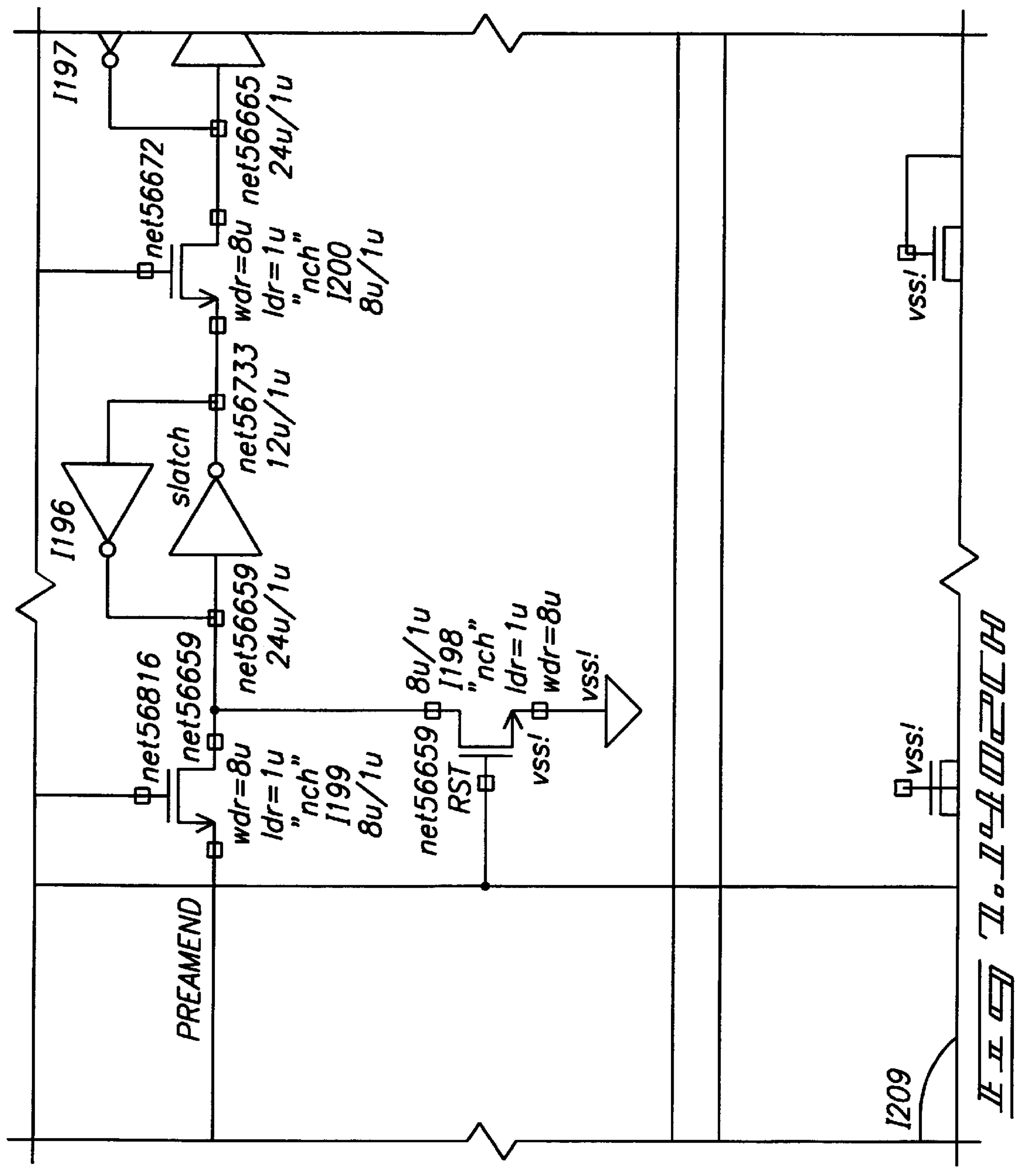
Fig. 7.11.402CH

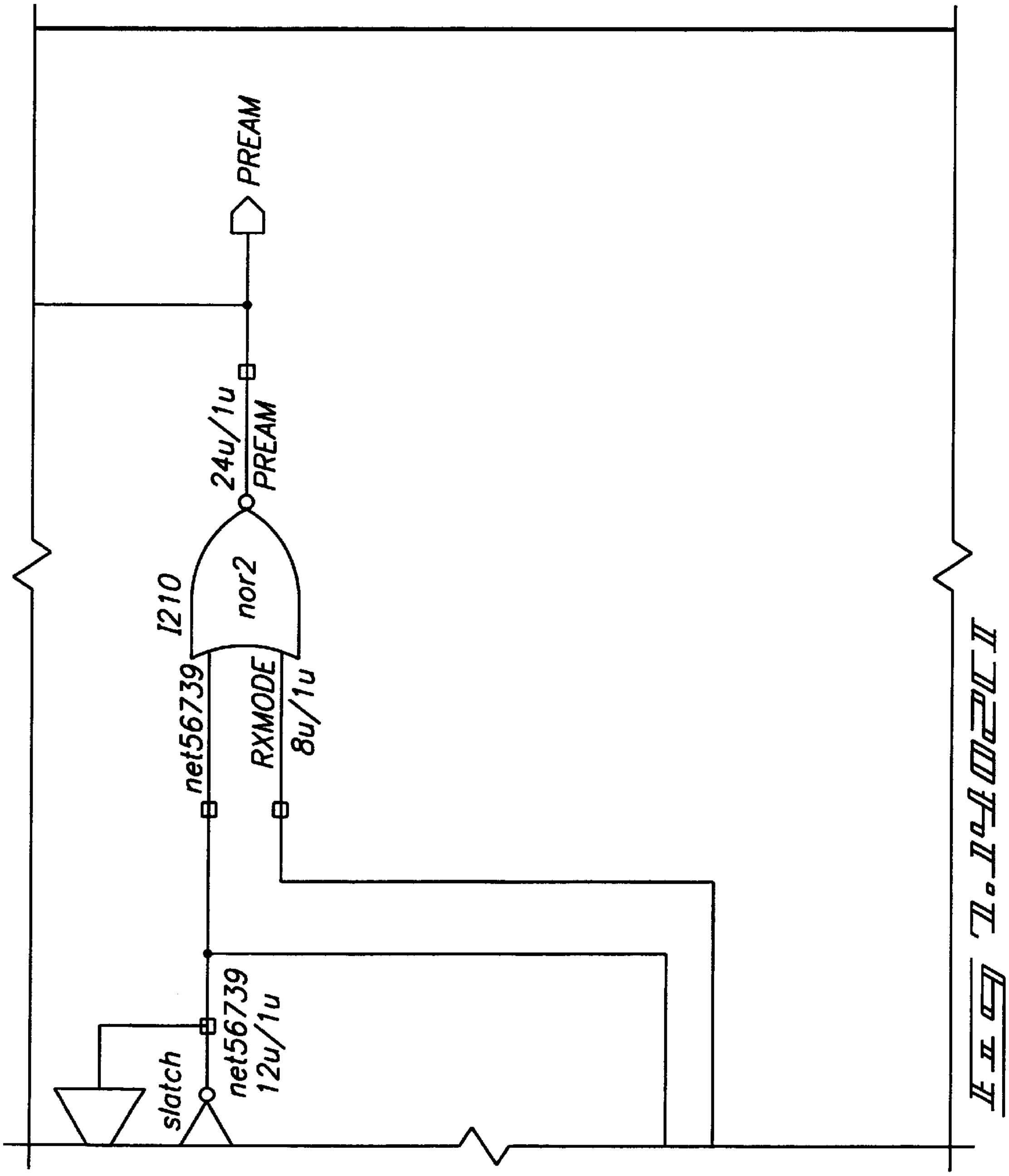
PREAM
24u/1u
PREAM
I210
nor2
net56739
RXMODE
8u/1u
slatch
net56739
12u/1u

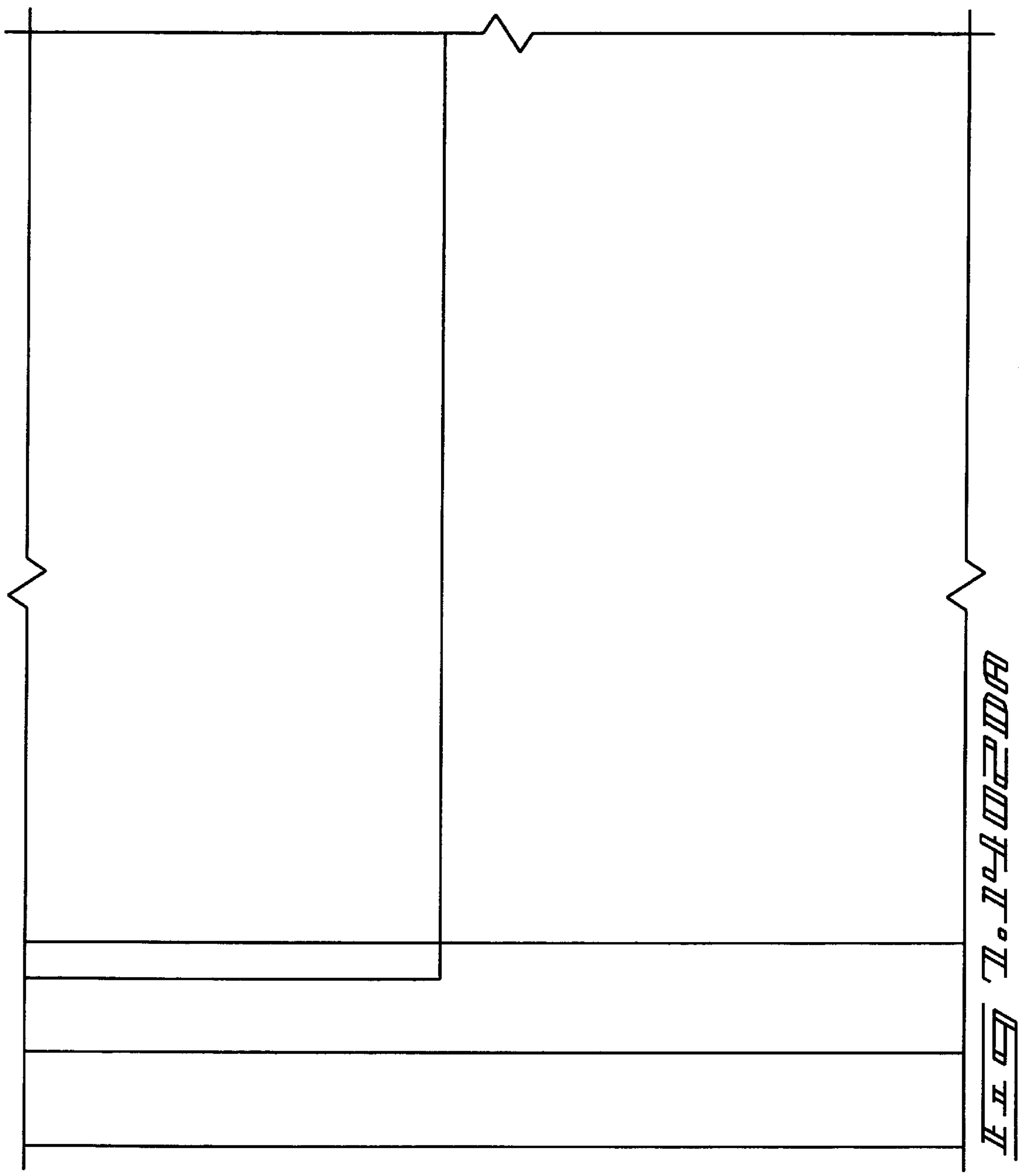
Fig 7.1402DA

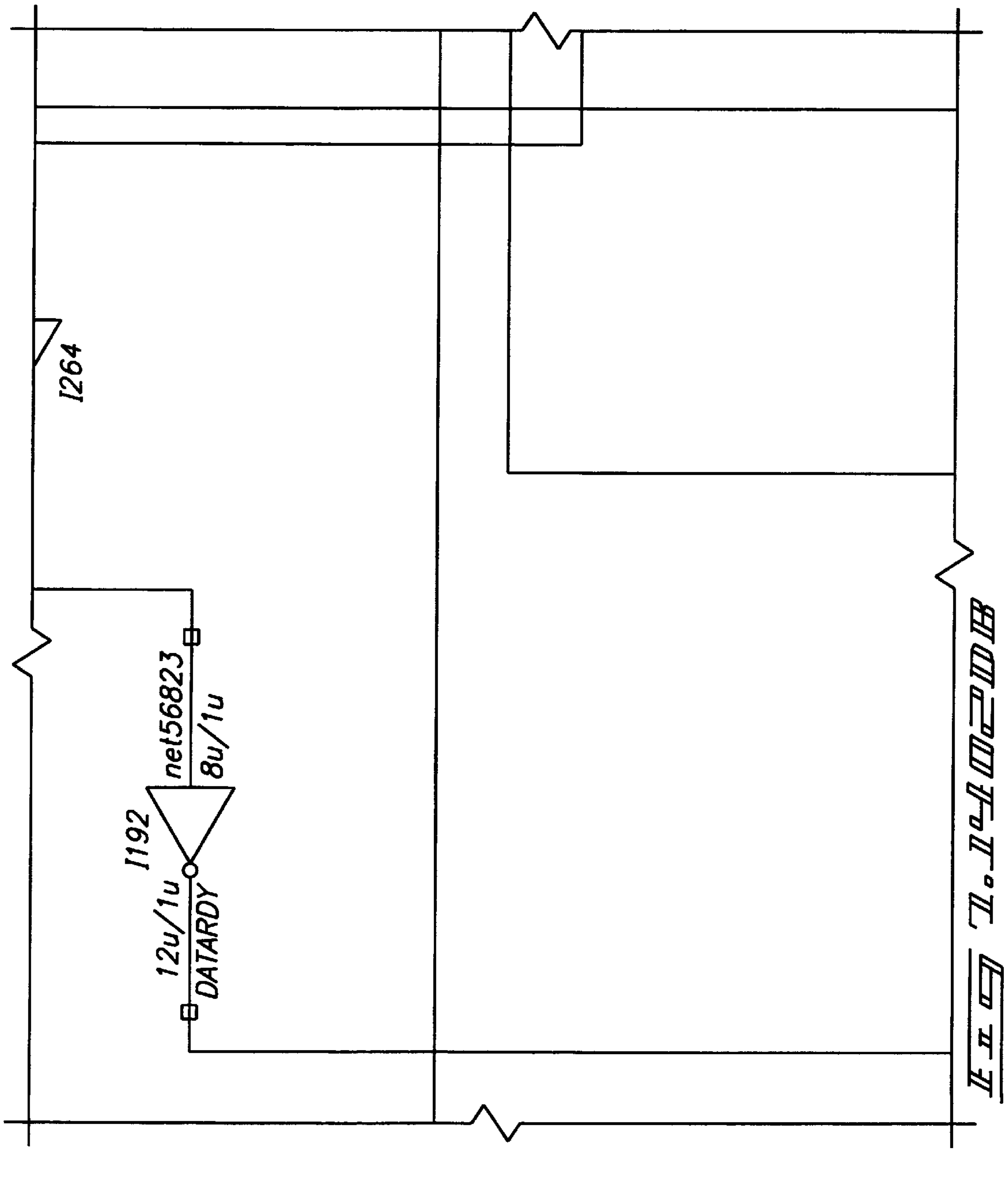
FIG. 7.14020B

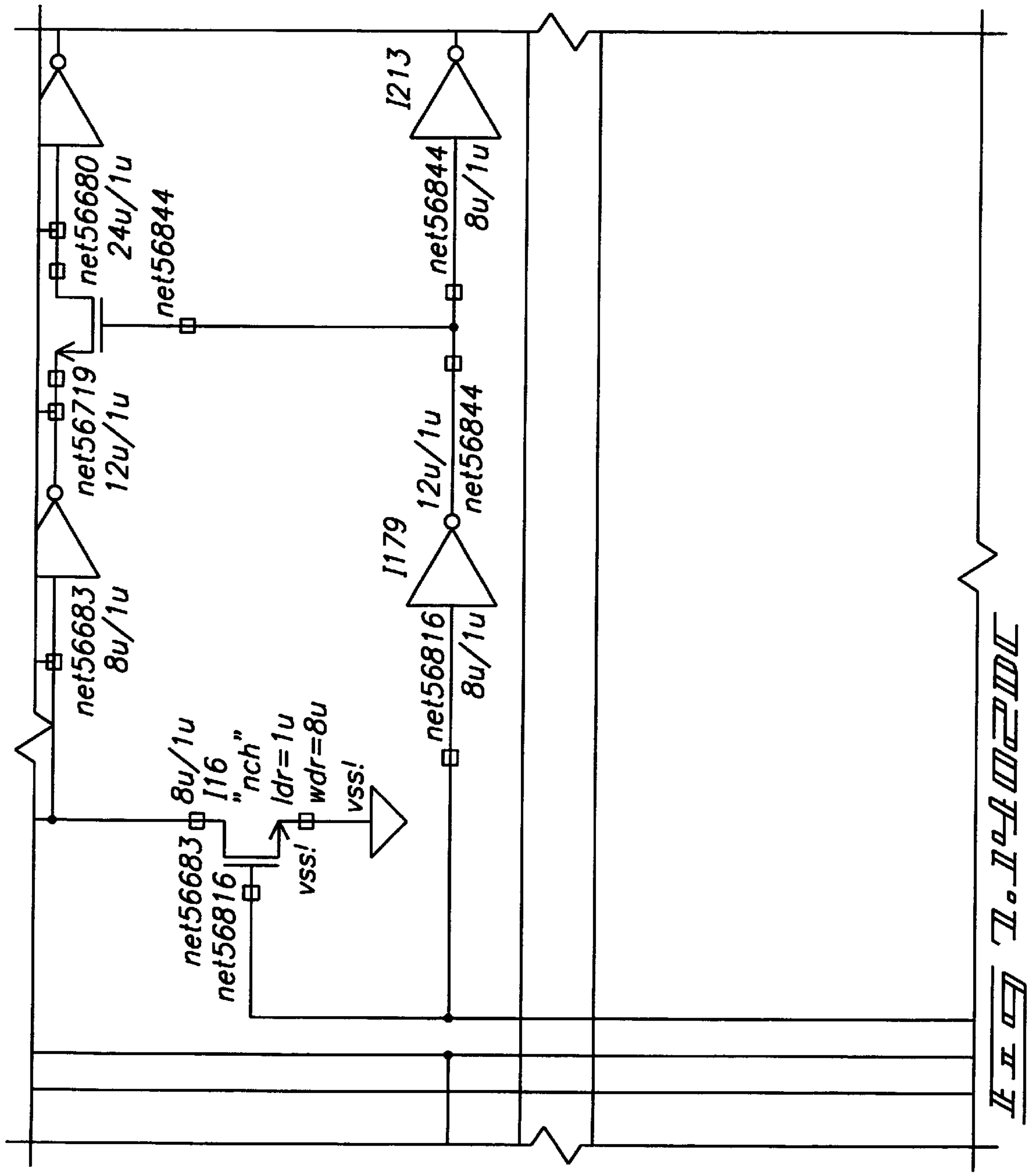
FIG. 7.11H20BC

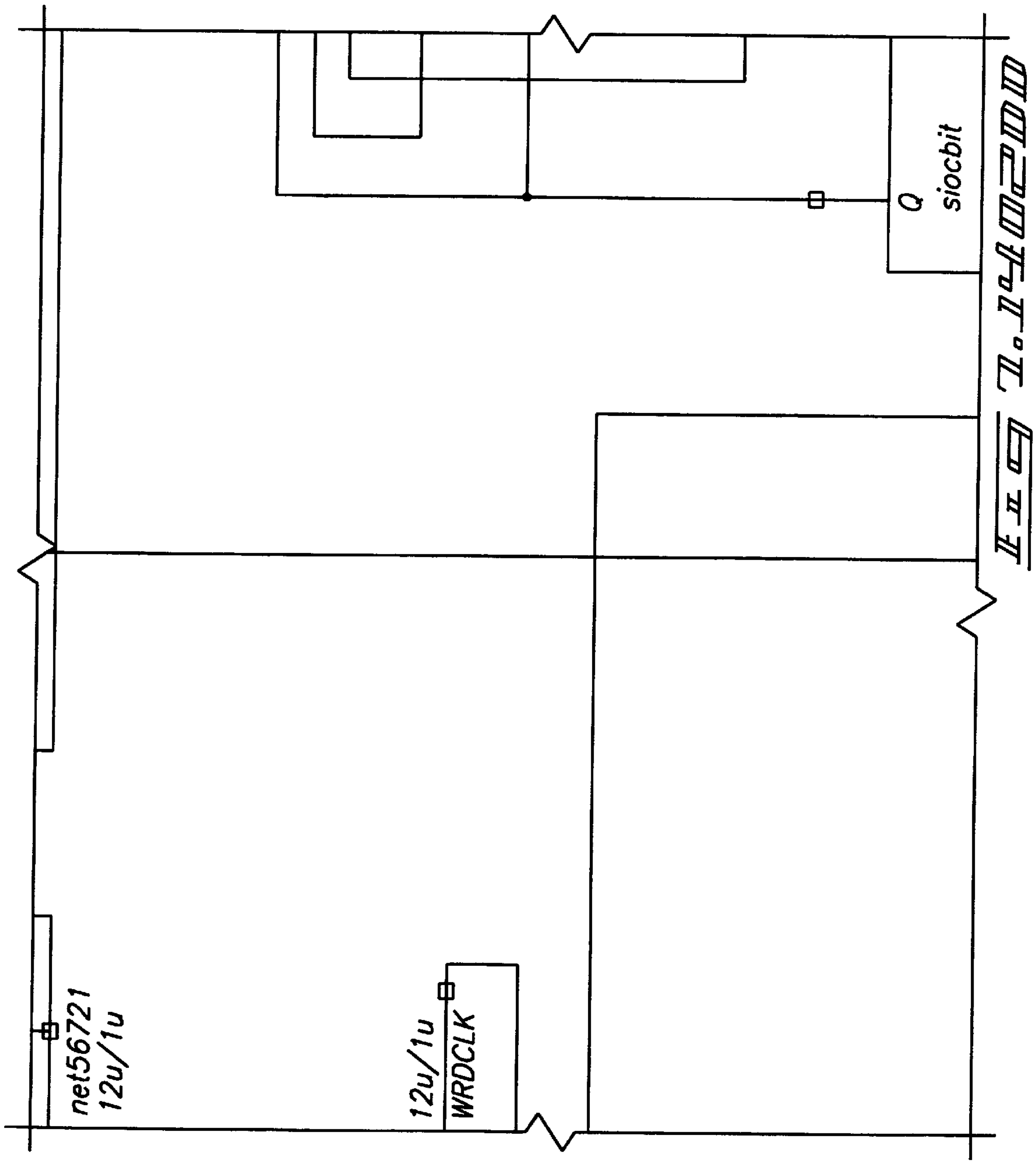
Fig. 7.140200

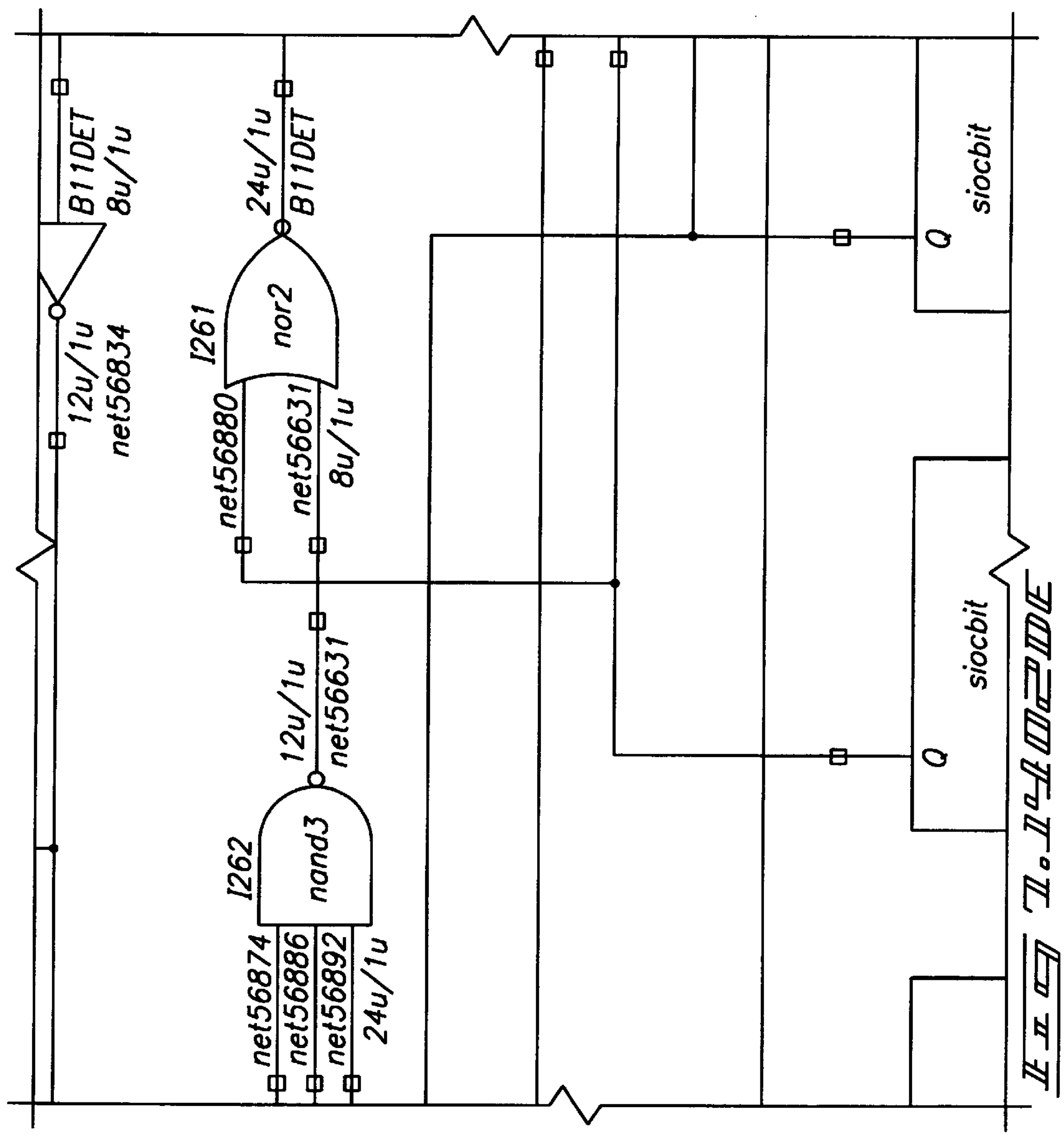
Fig. 7.II.402DE

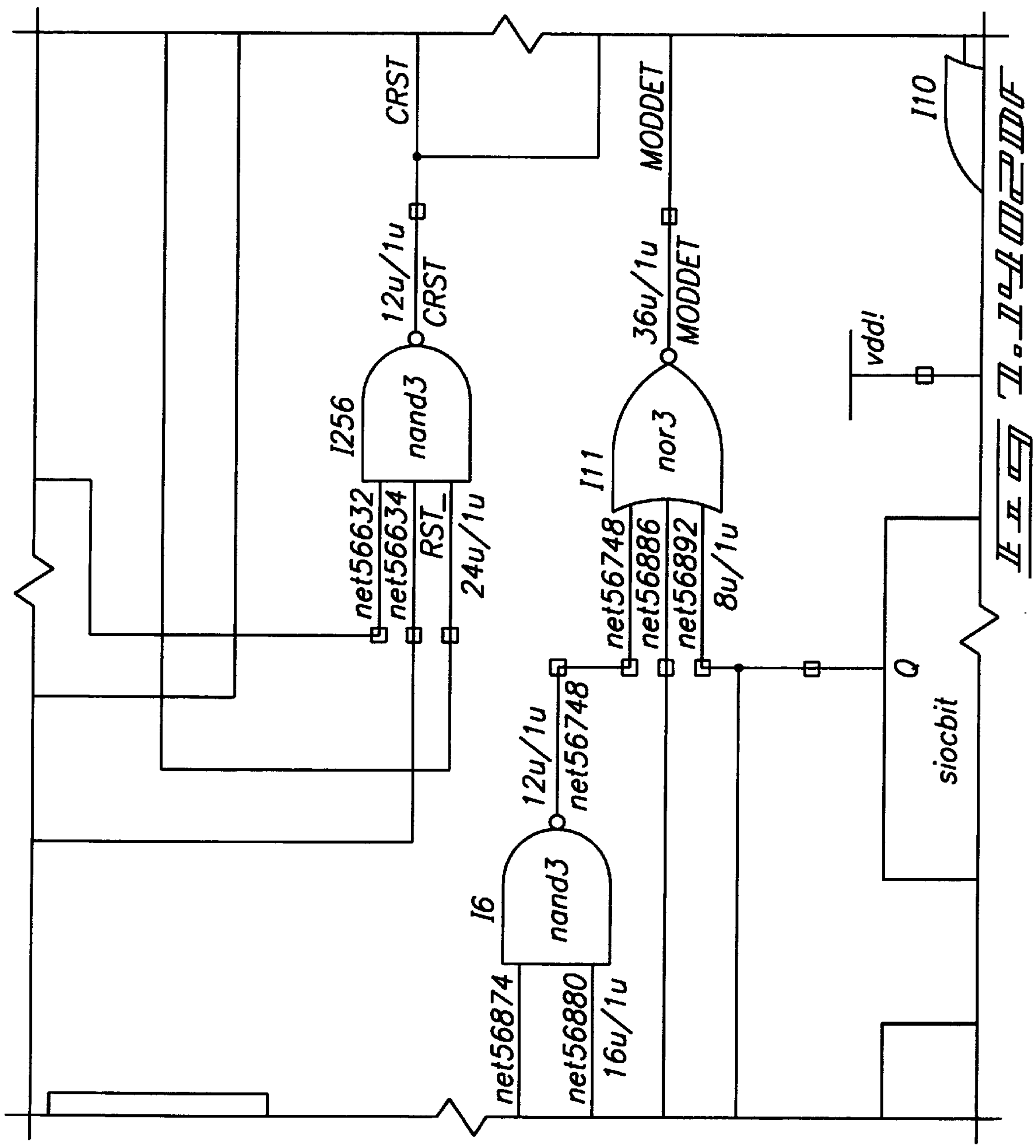
CRST
12u/1u
CRST
I256
nand3
net56632
net56634
RST_
24u/1u
MODDET
36u/1u
MODDET
I11
nor3
net56748
net56886
net56892
8u/1u
I10
vdd!
Q
siocbit
12u/1u
net56748
I6
nand3
net56874
net56880
16u/1u

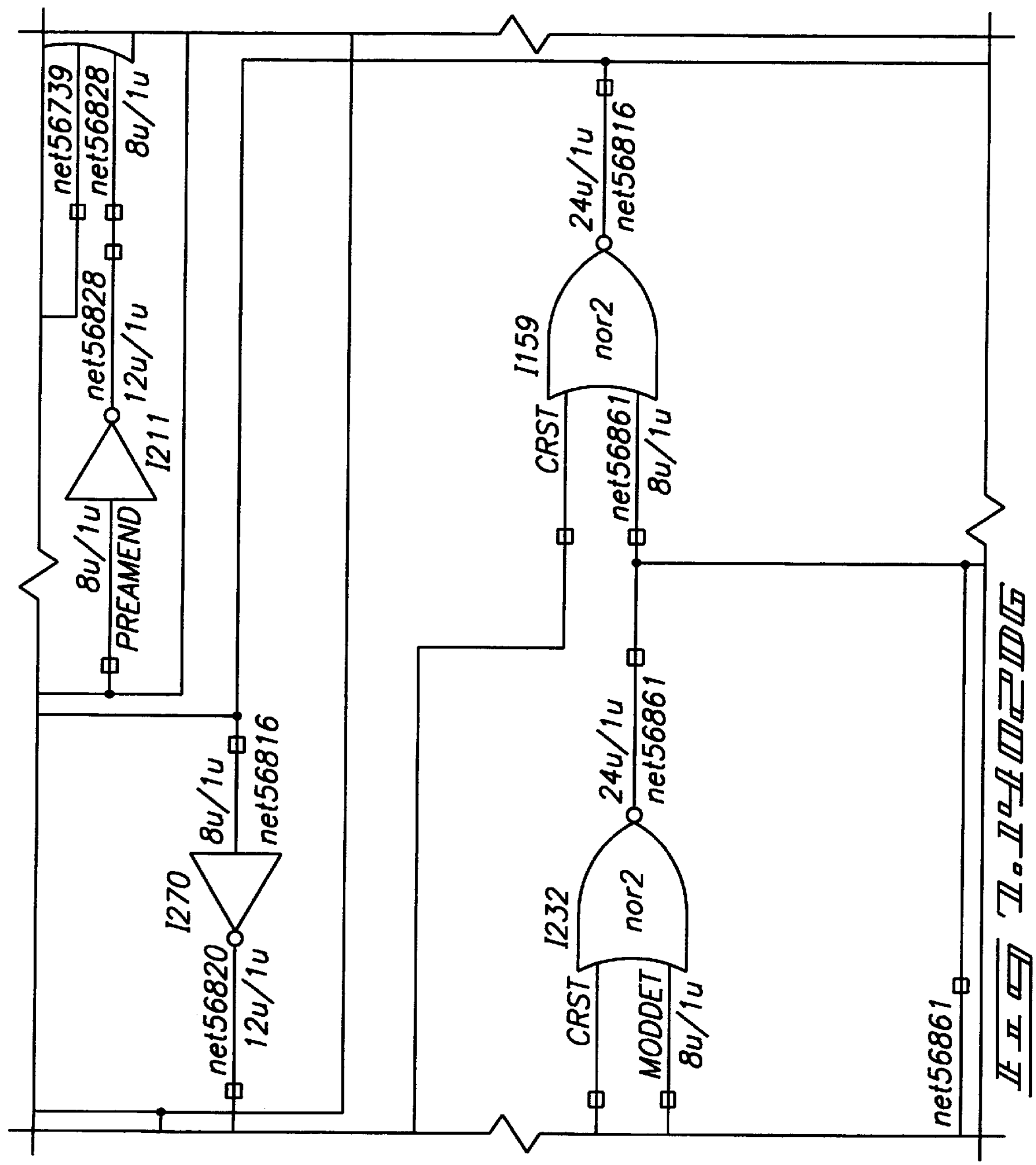
Fig. 7.1402DG

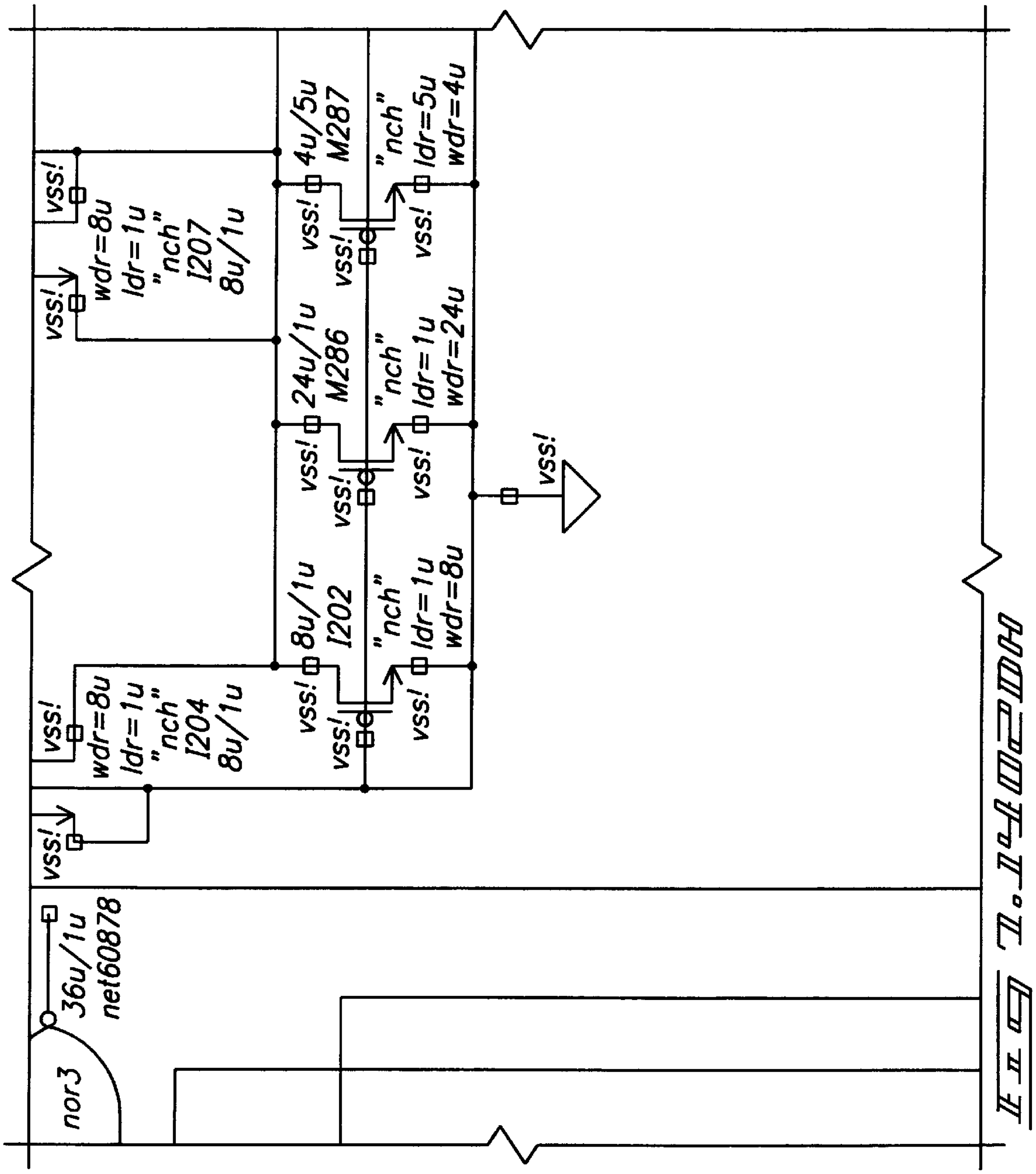
FIG. 7.140ZOH

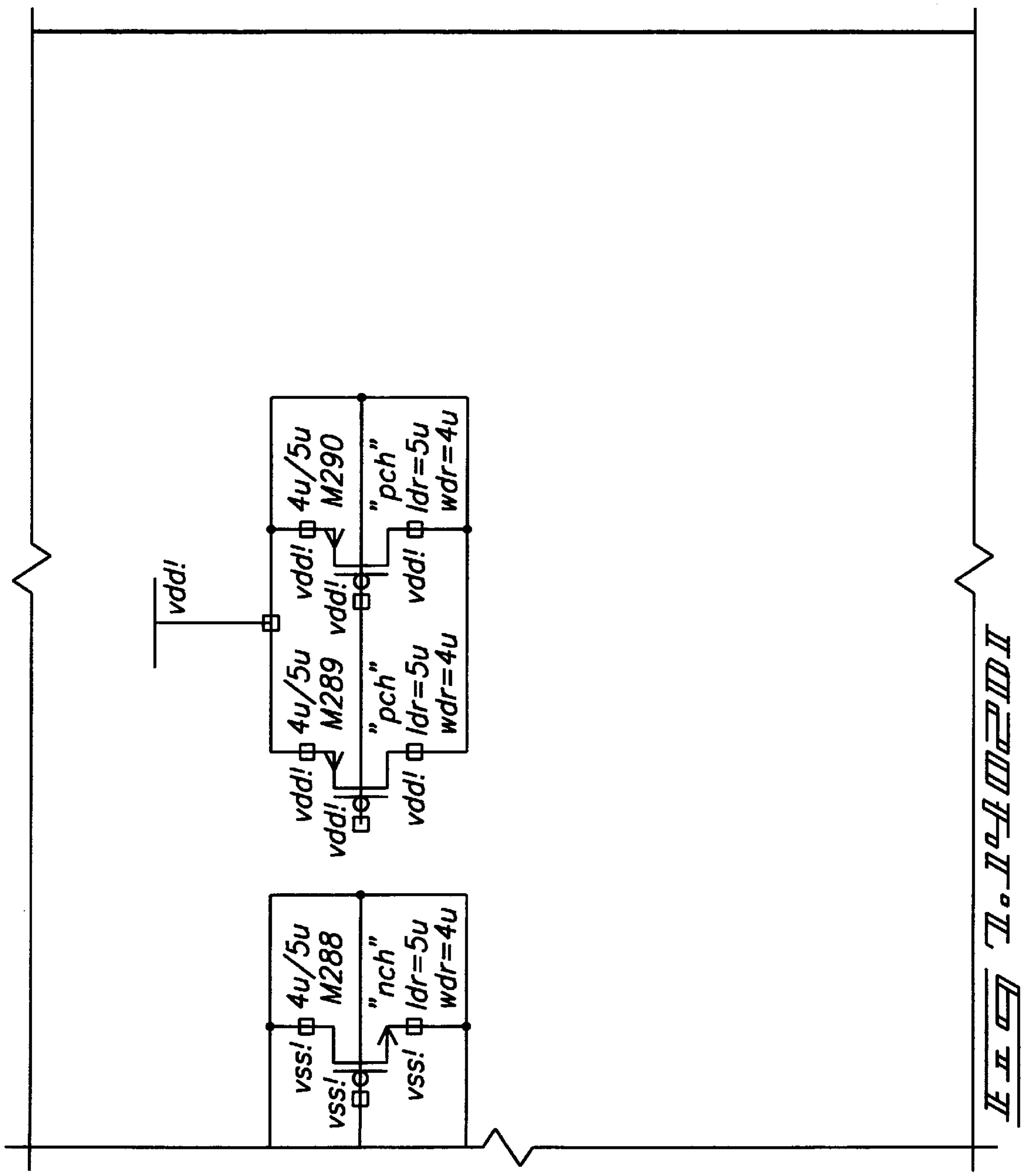
FIG. 7.14D2D1

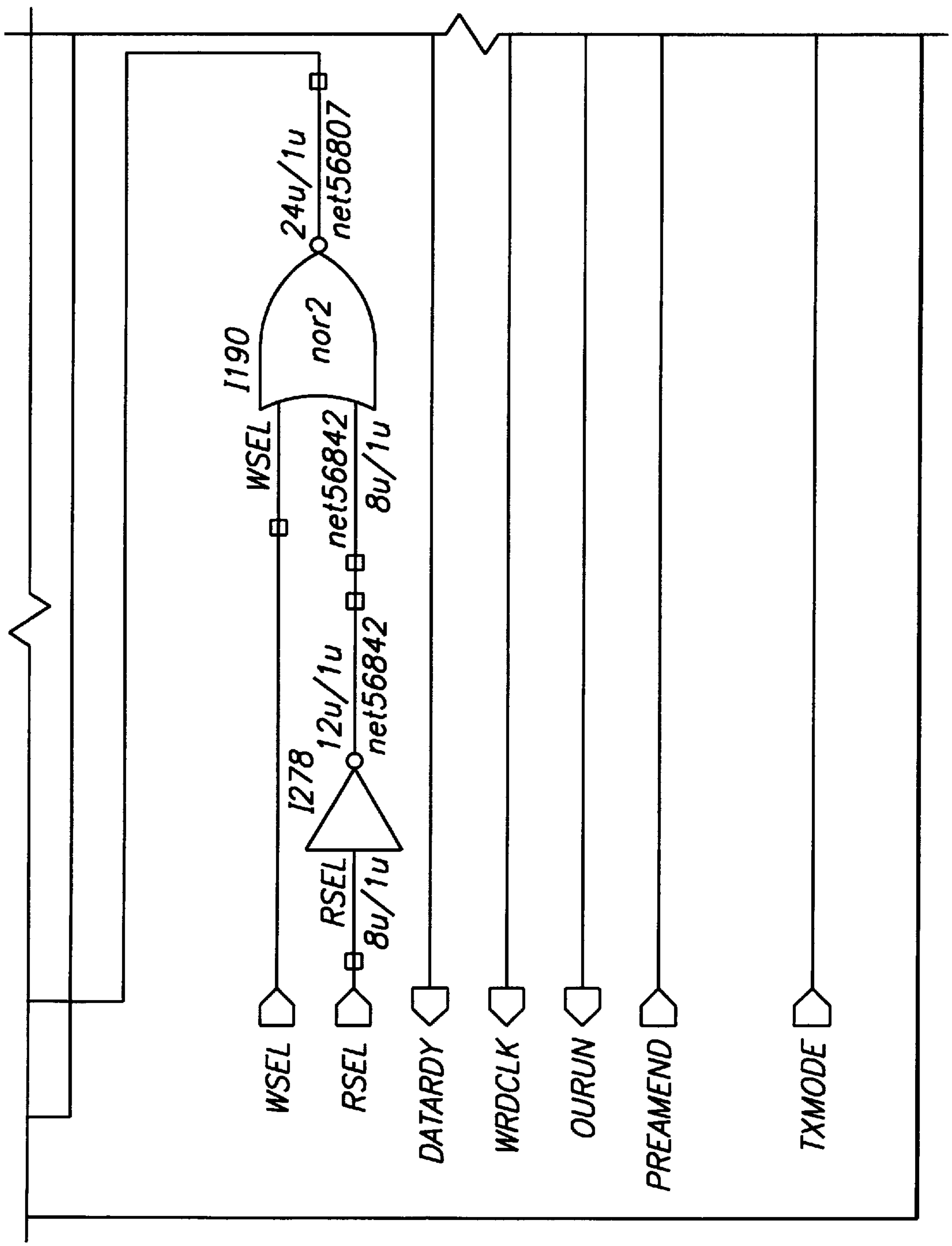
Fig. 7.140ZEA

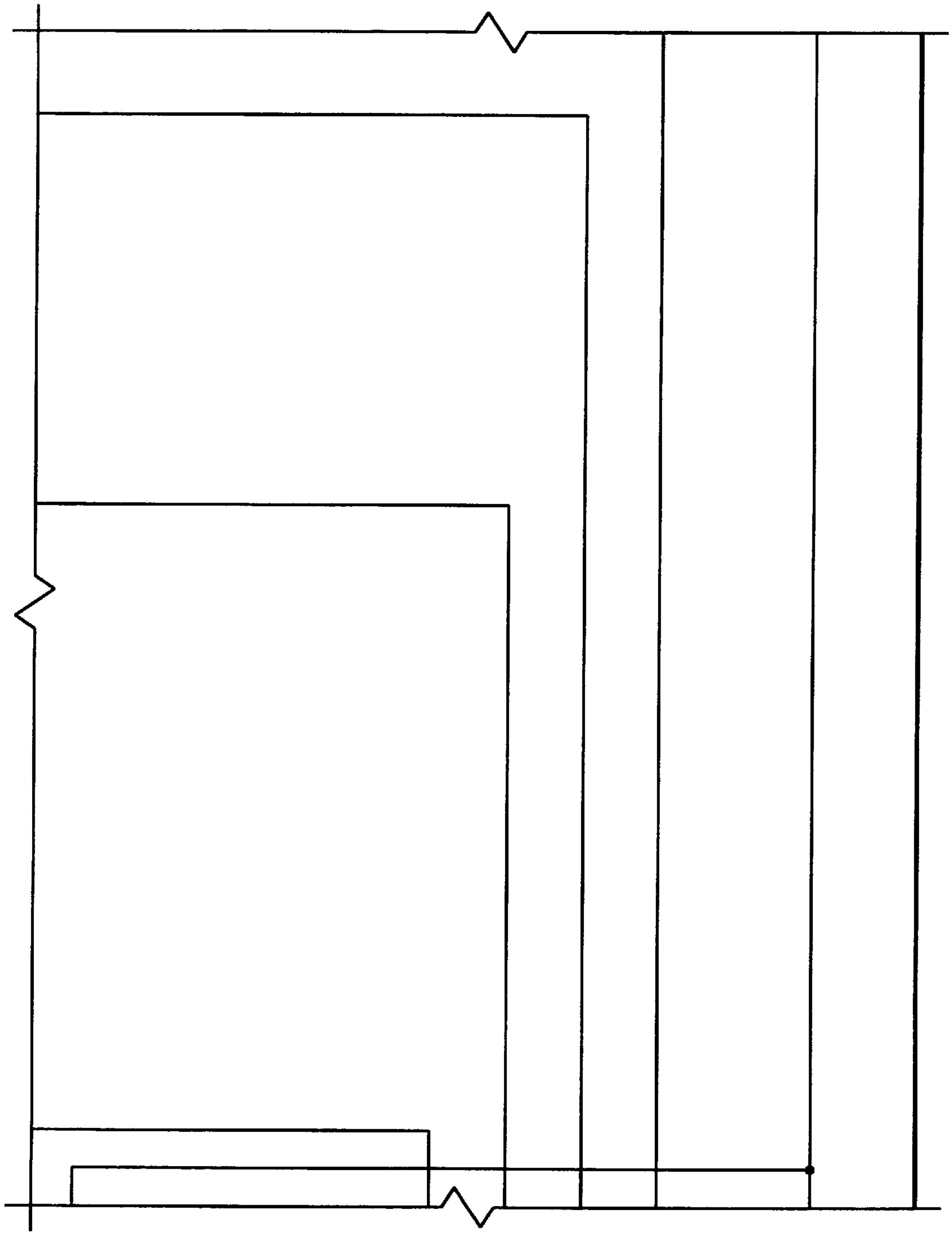
FIG. 7.1402EB

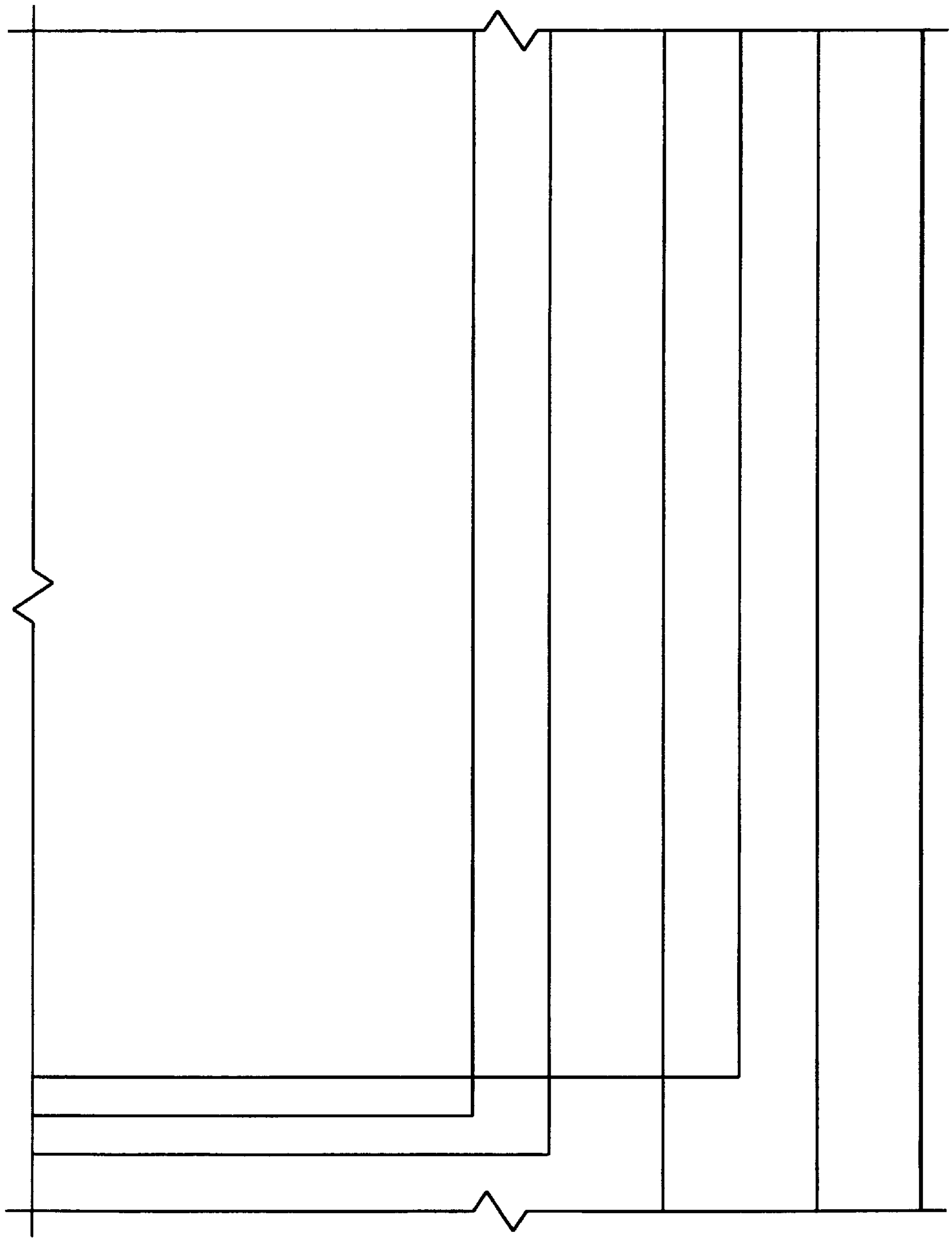
FIG. 7.1402EC

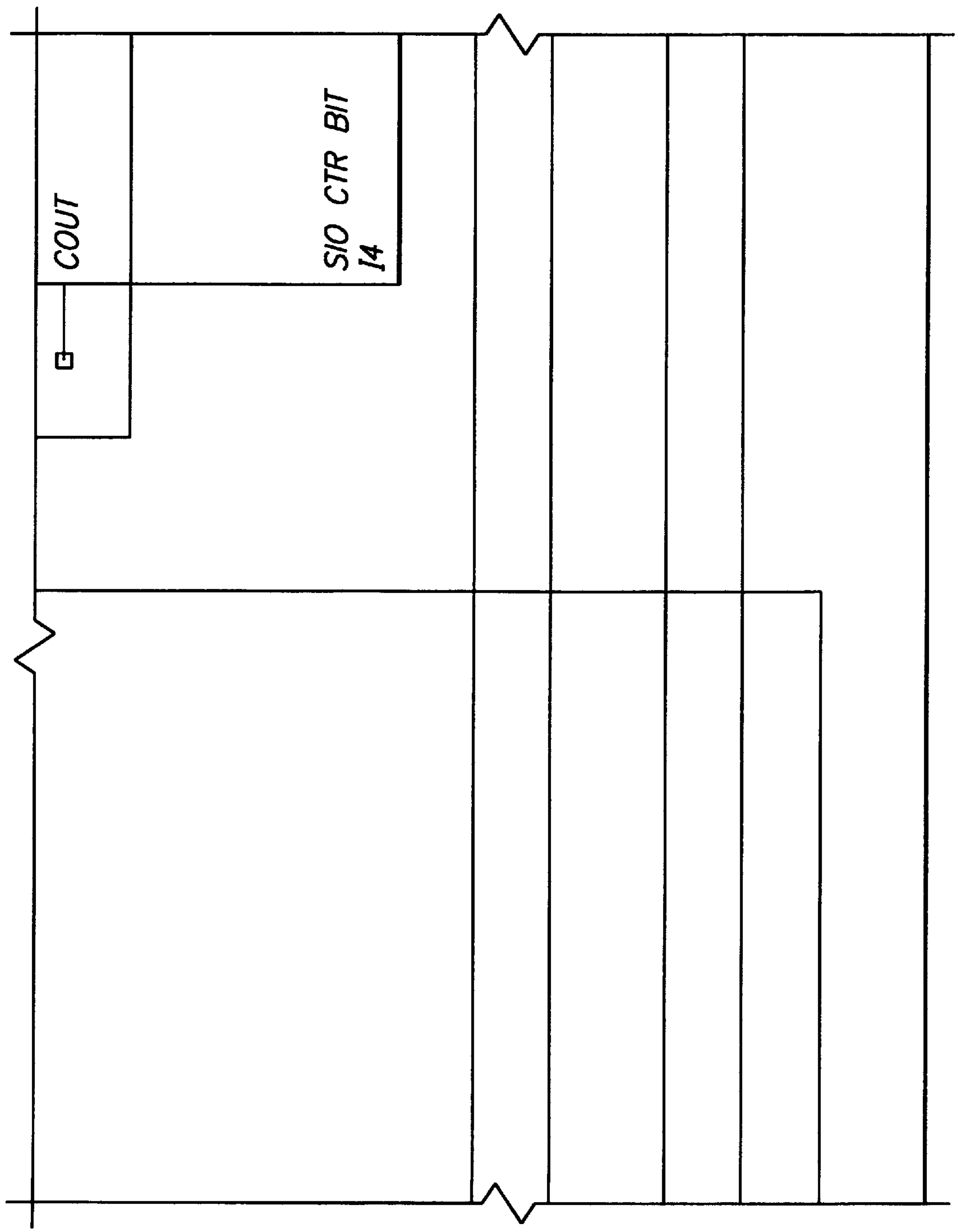
FIG. 7.1402ED

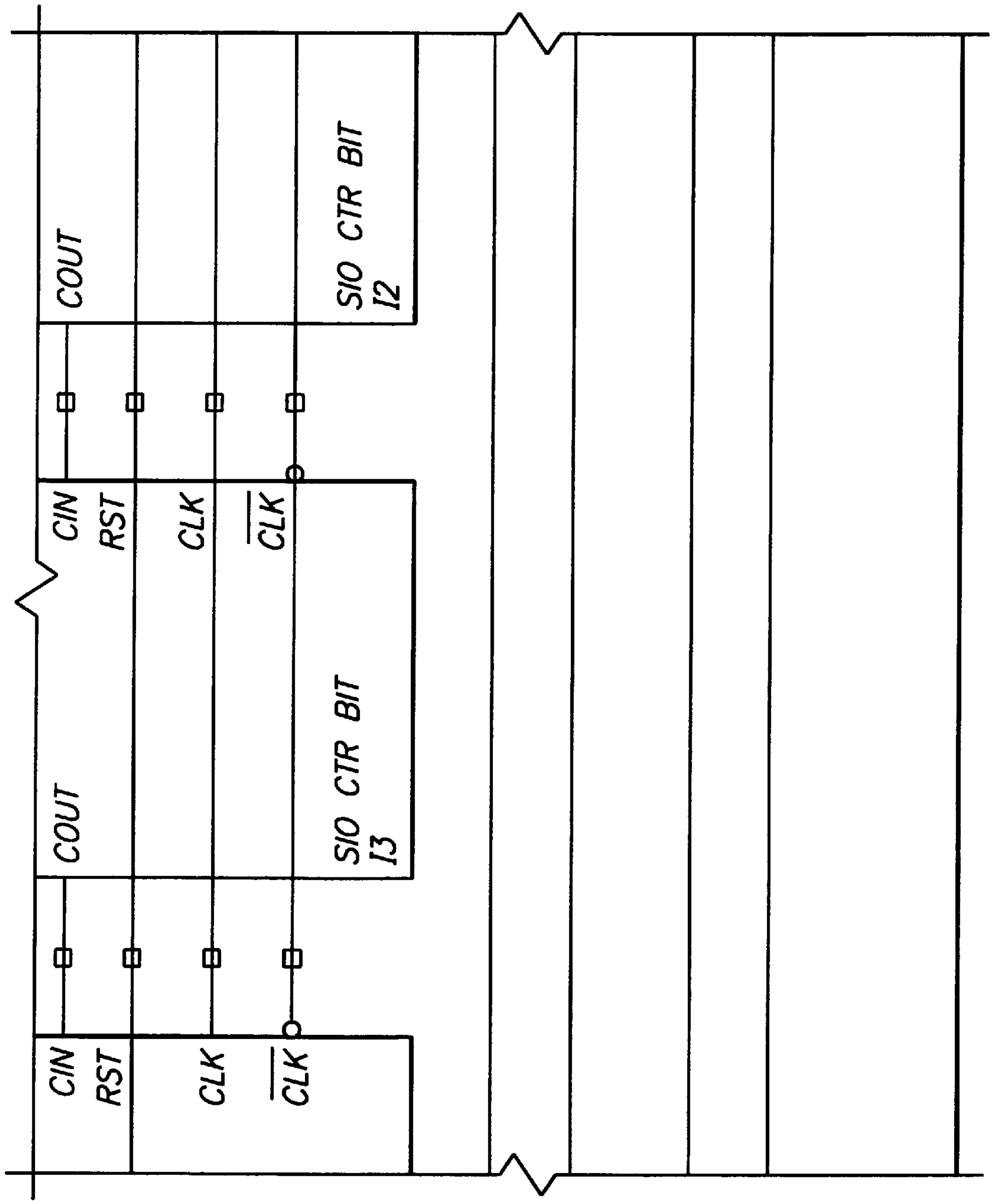
FIG. 7.140ZEE

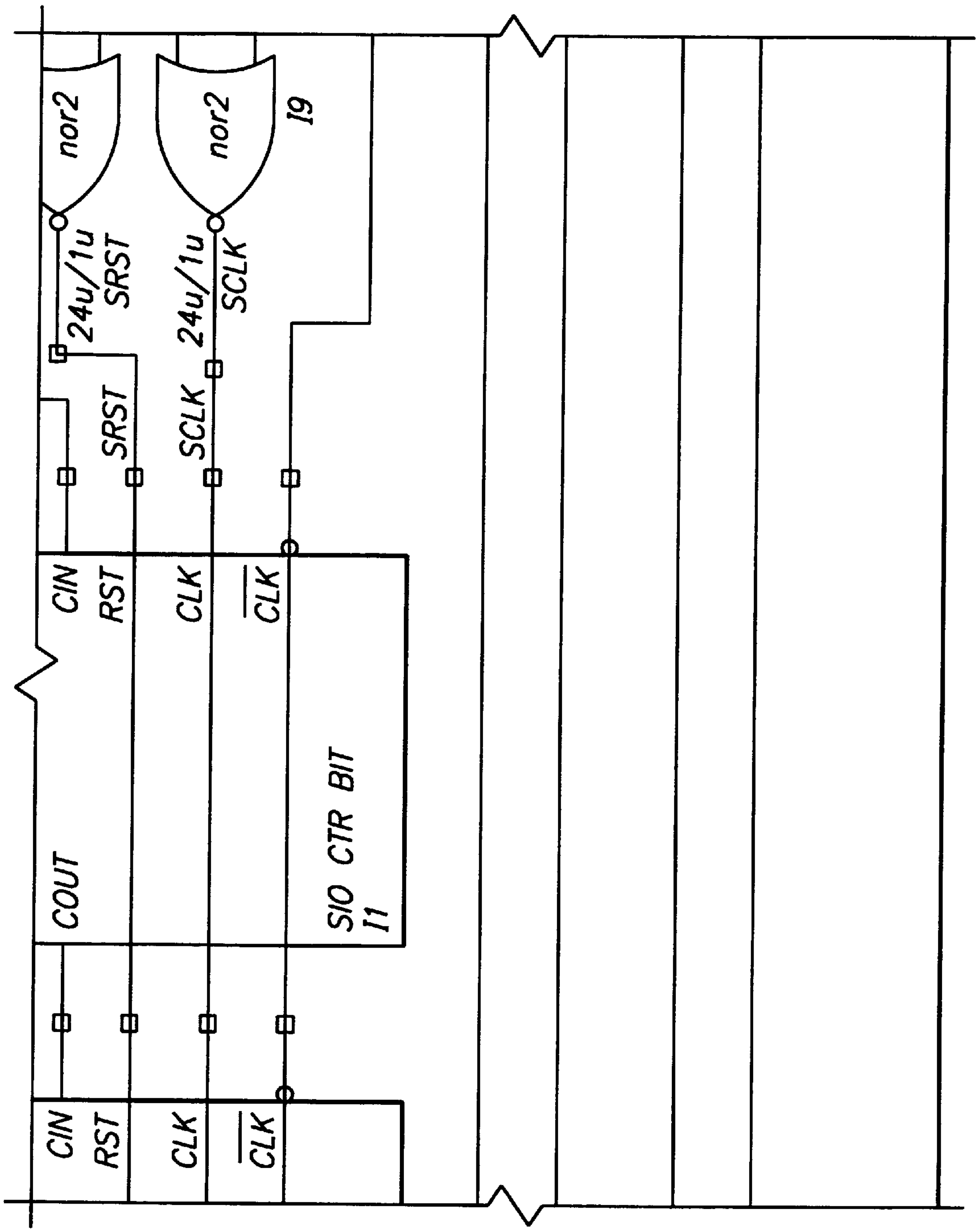
FIG. 7.14D2EF

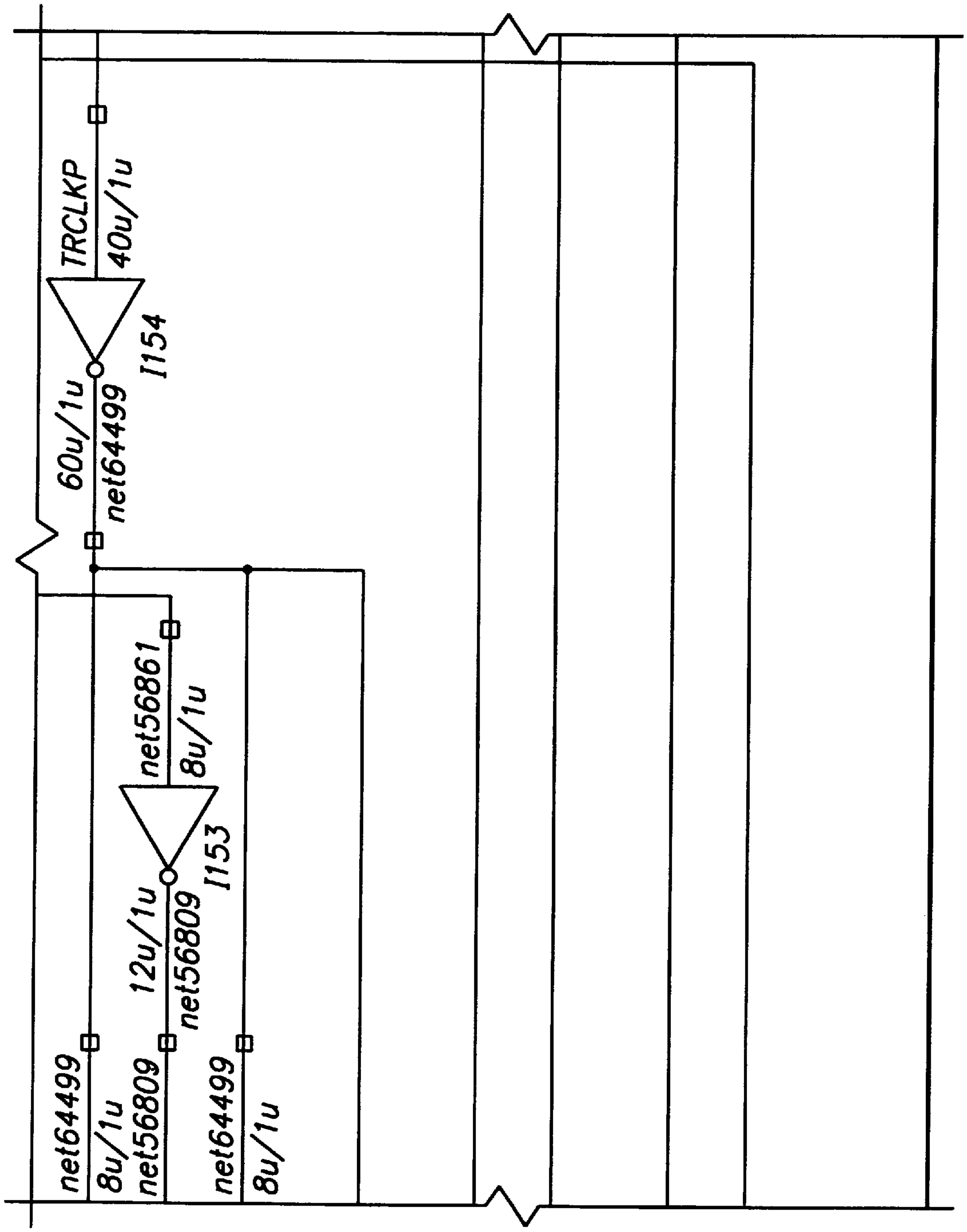
Fig. 7.140ZEG

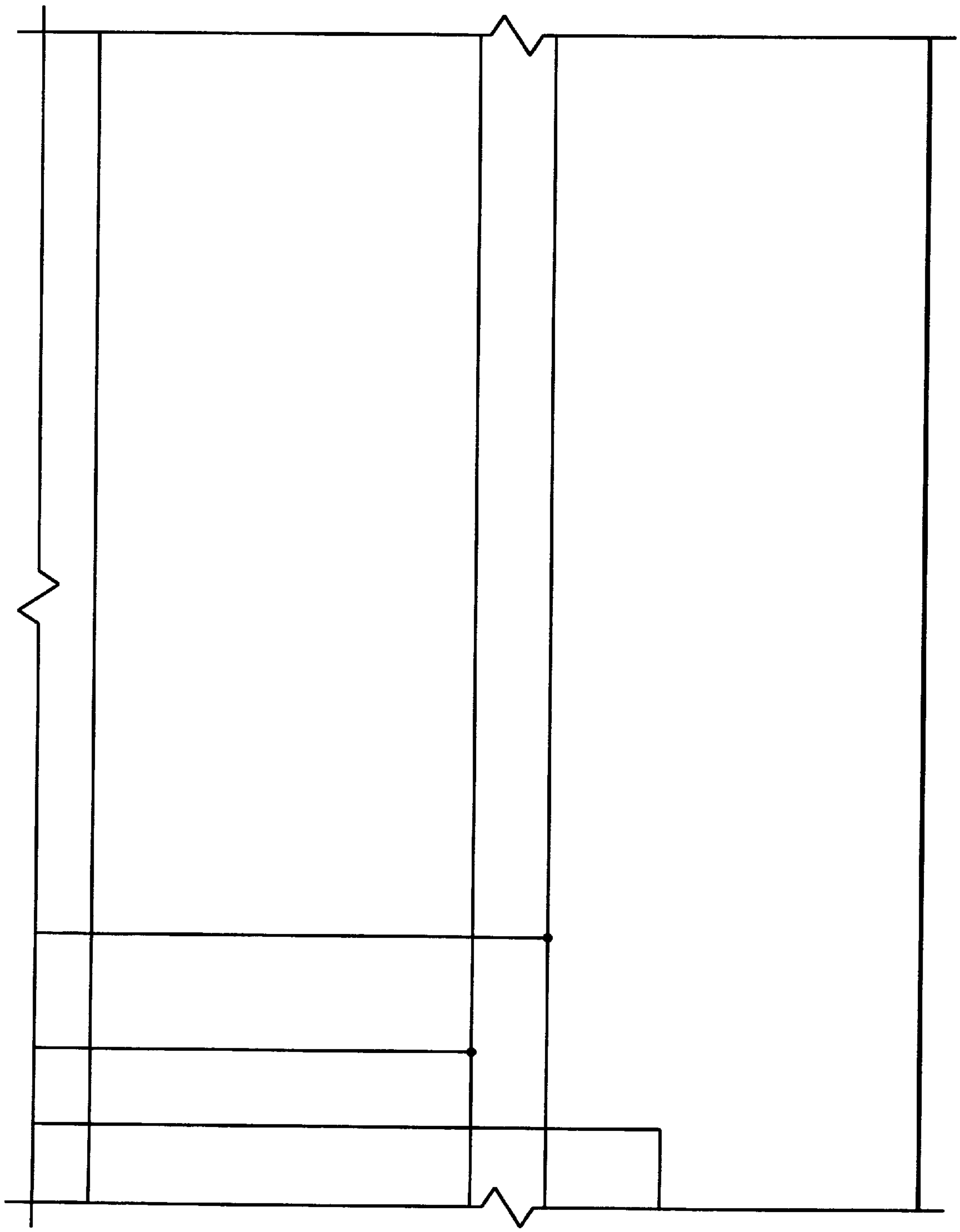
FIG. 7.1402EH

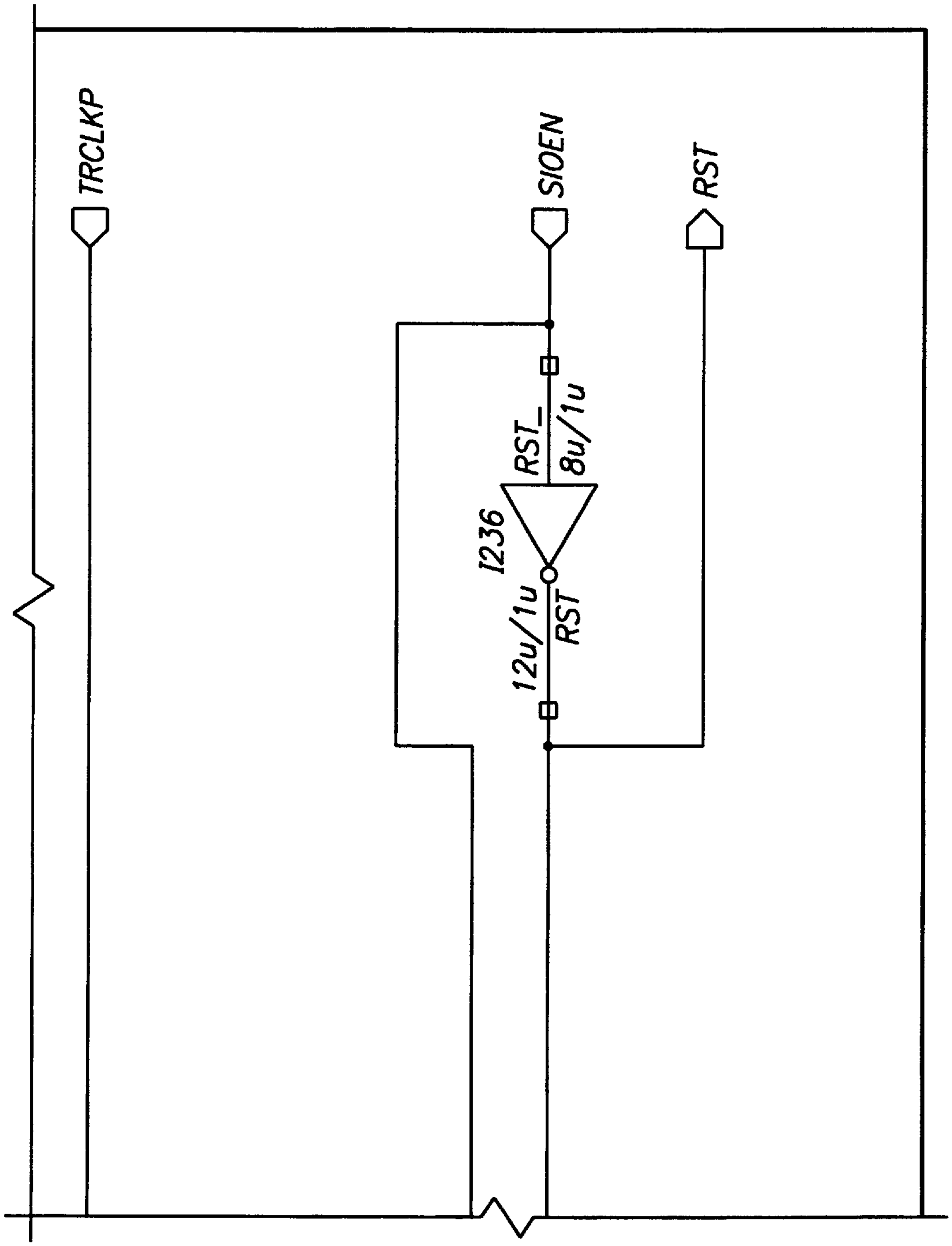
FIG. 7.140ZE1

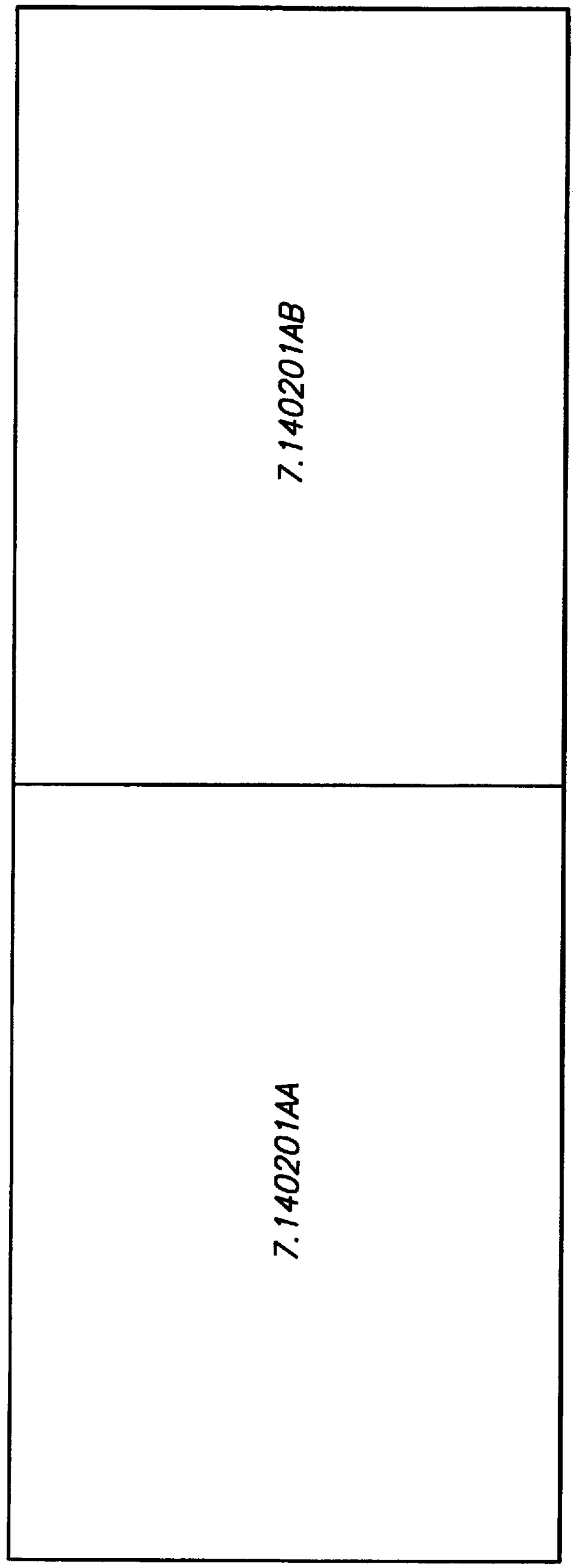
FIG. 7.140201

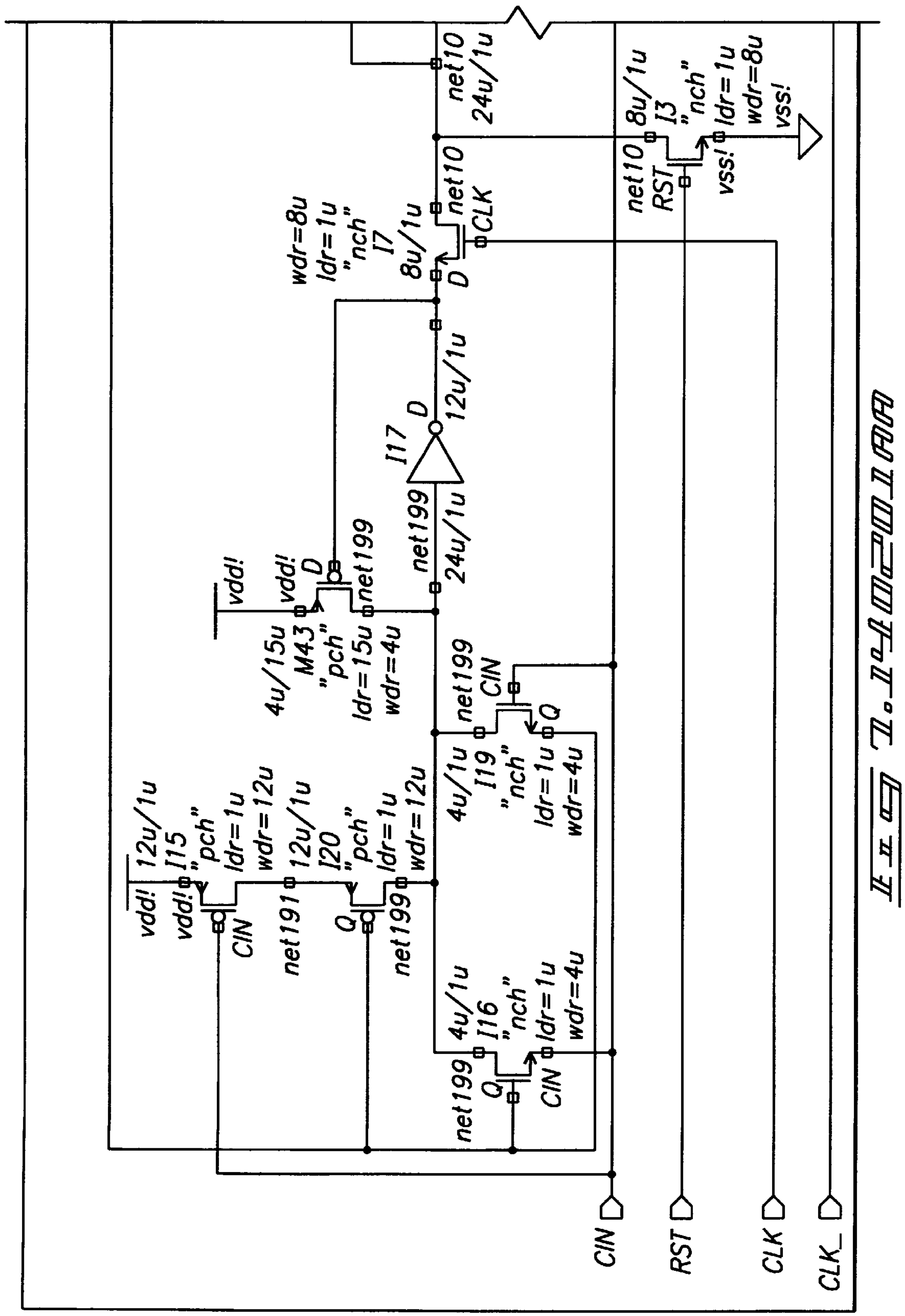
Fig. 7.140201AA

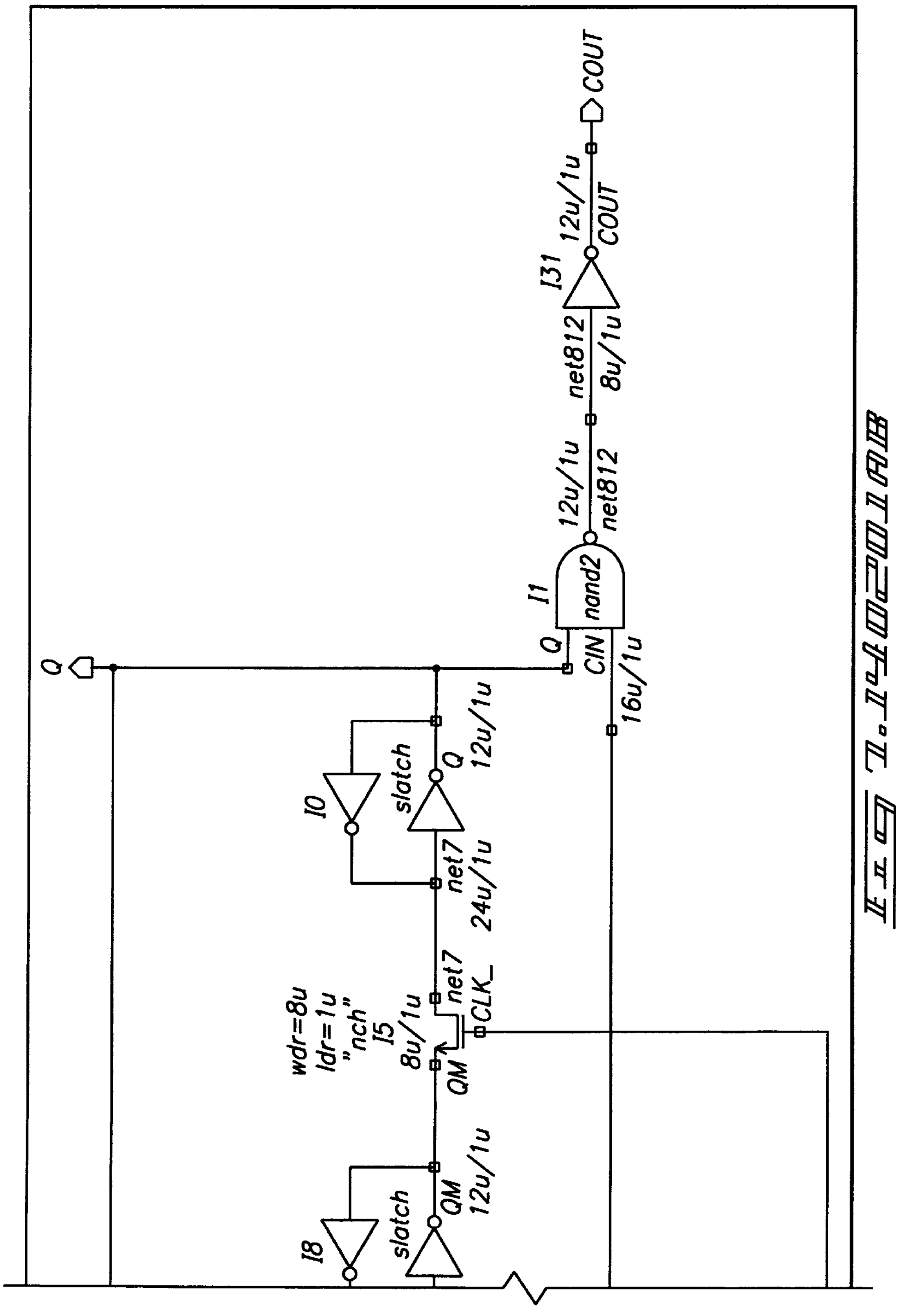
COUT
12u/1u
COUT
I31
net812
8u/1u
12u/1u
net812
I1
nand2
Q
CIN
16u/1u
Q
12u/1u
Q
slatch
I0
net7
24u/1u
net7
CLK_
wdr=8u
ldr=1u
"nch"
I5
8u/1u
QM
12u/1u
QM
slatch
I8

| | | | |
|---|---|---|---|
| 7.15AA | 7.15AB | 7.15AC | 7.15AD |
| 7.15BA | 7.15BB | 7.15BC | 7.15BD |
| 7.15CA | 7.15CB | 7.15CC | 7.15CD |
| 7.15DA | 7.15DB | 7.15DC | 7.15DD |
| 7.15EA | 7.15EB | 7.15EC | |

Fig. 7.15

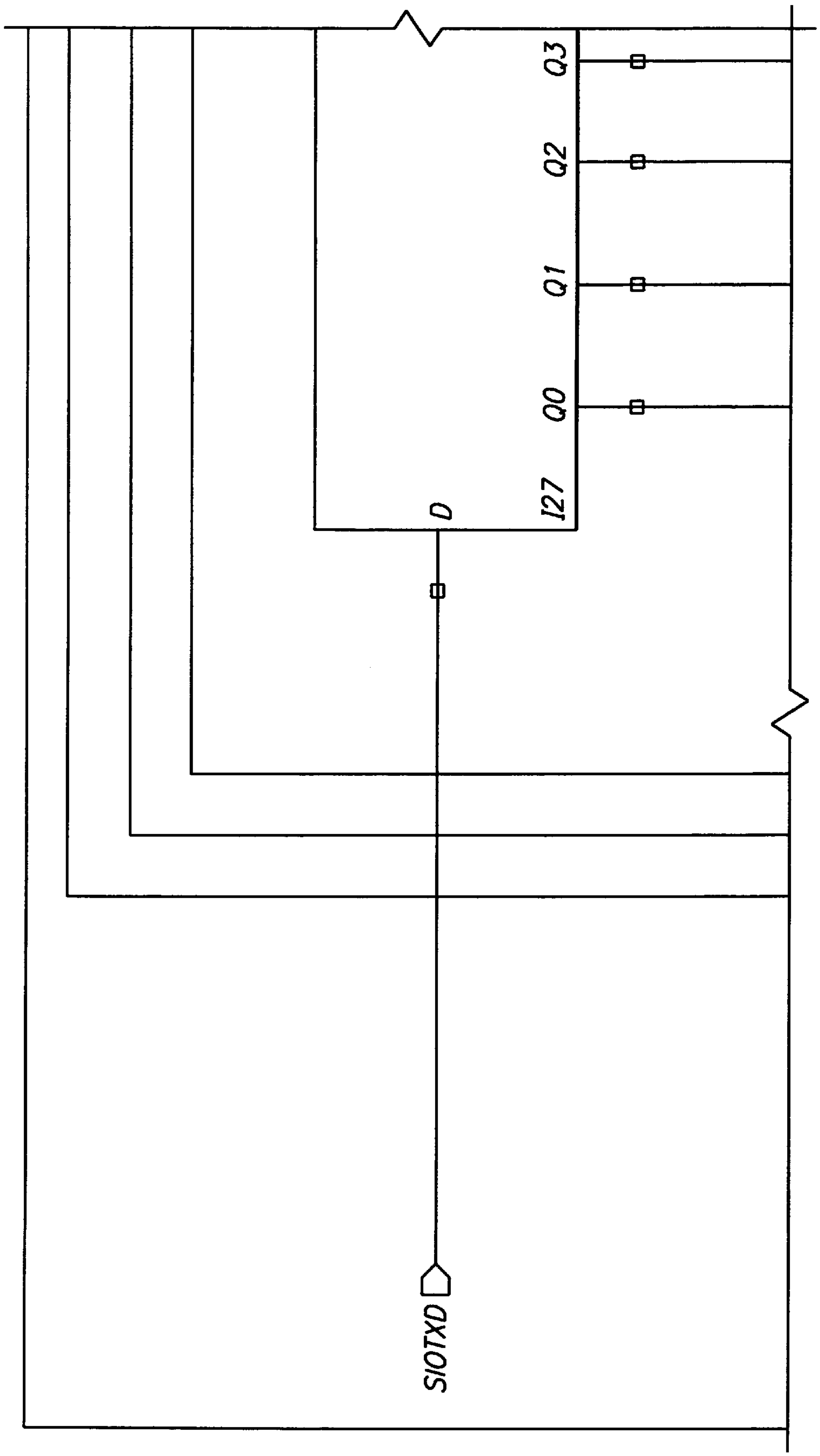
FIG. 7.15AA

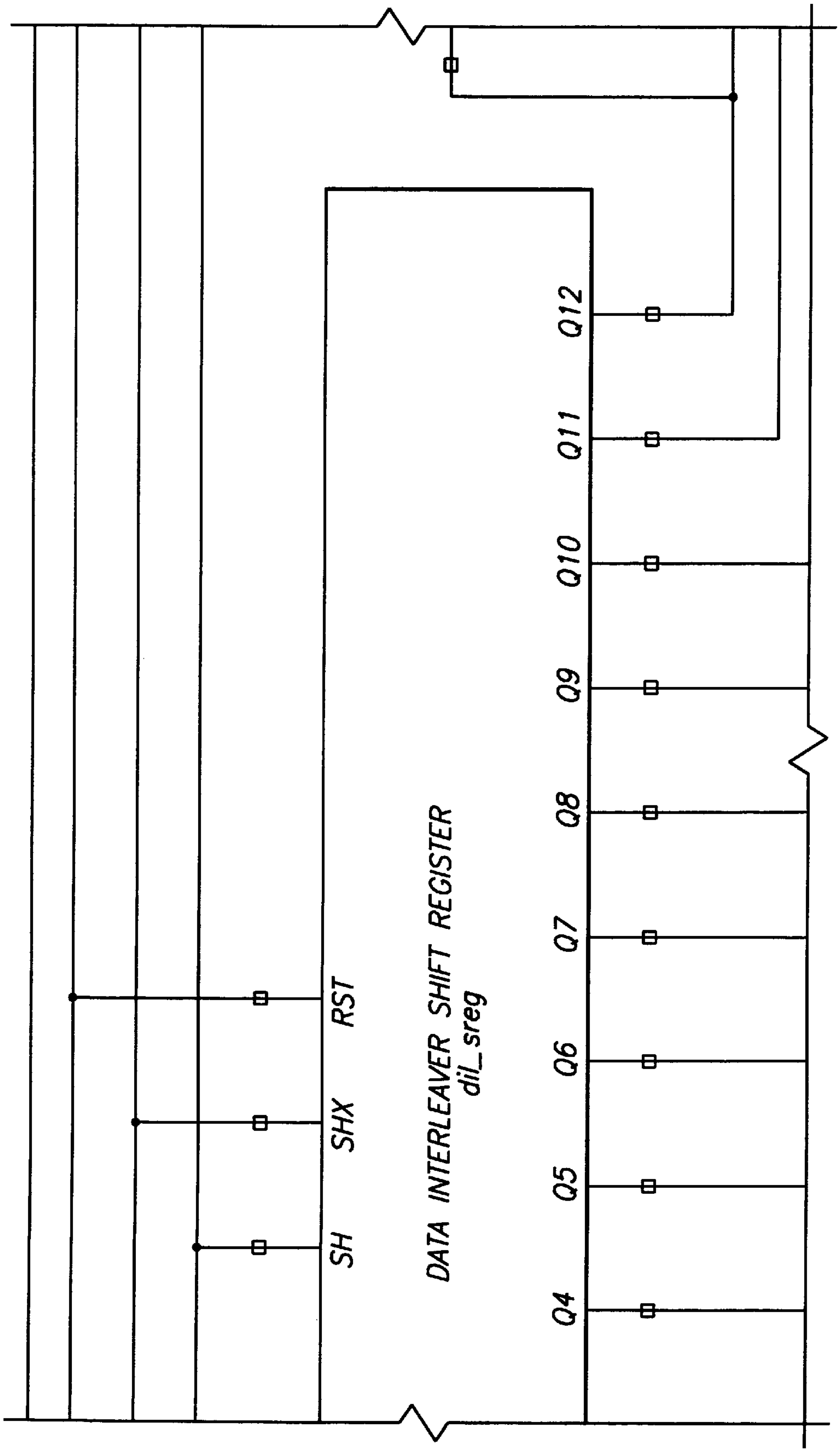
Fig. 7.158B

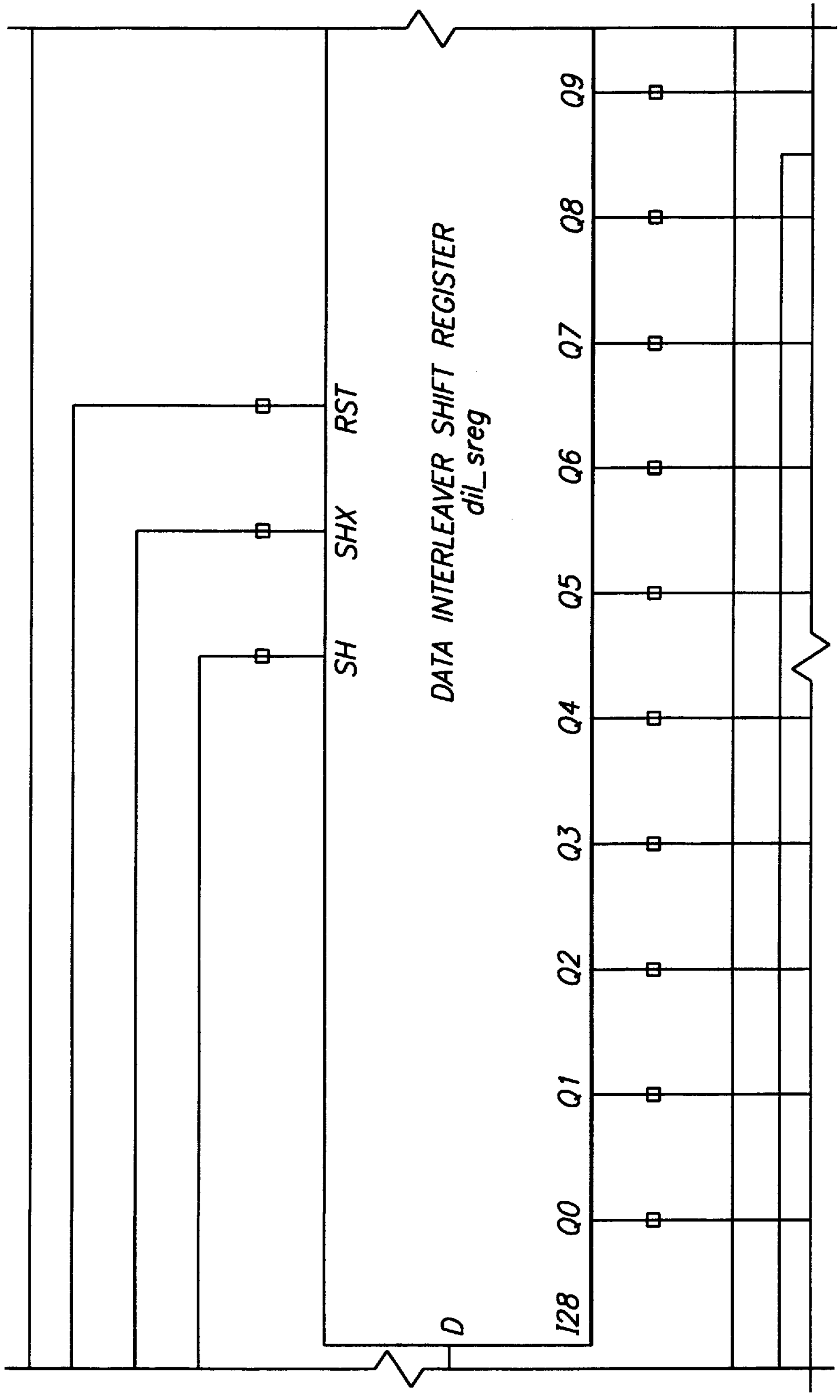
FIG. 7.15AC

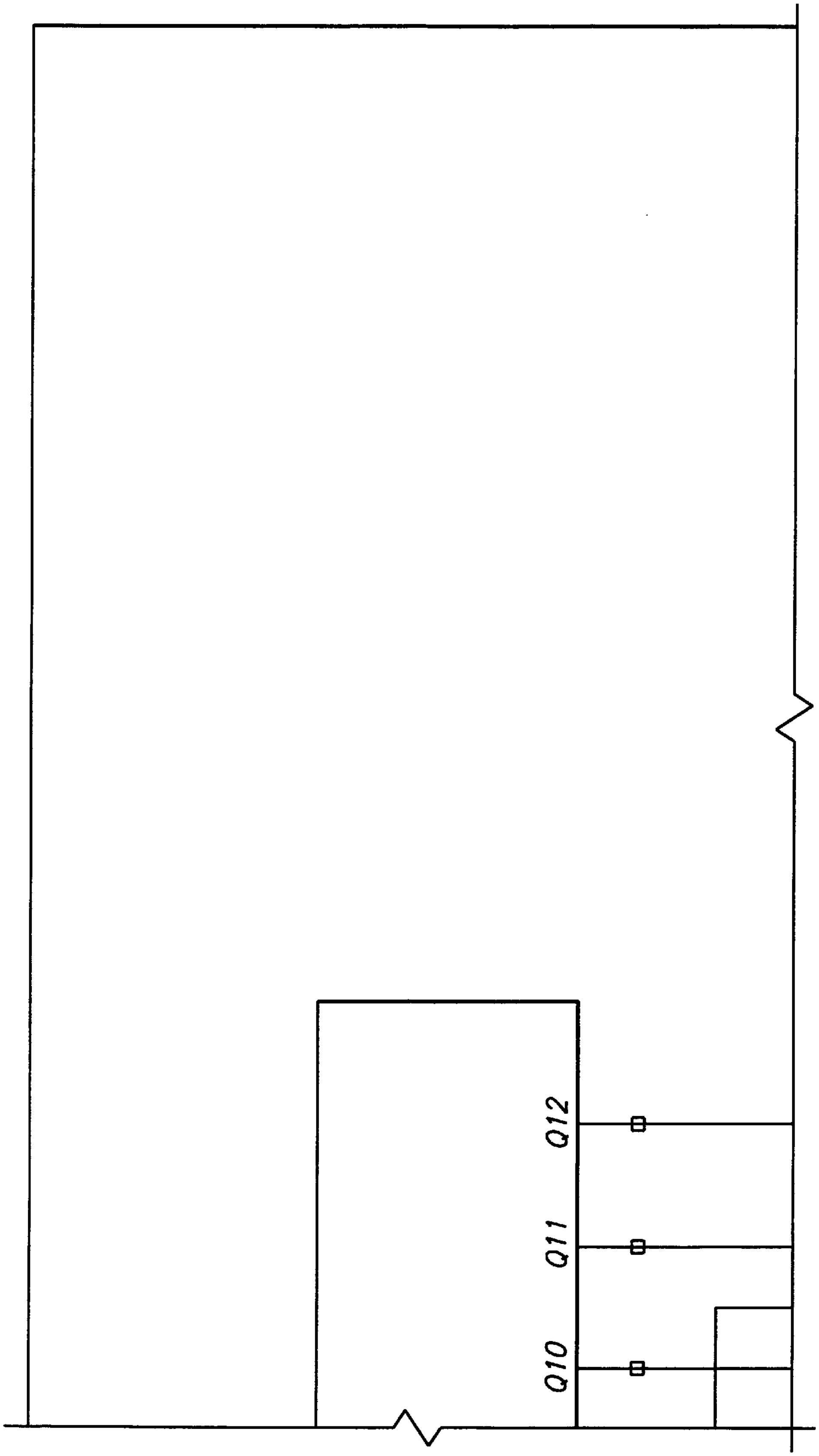
FIG. 7.15AD

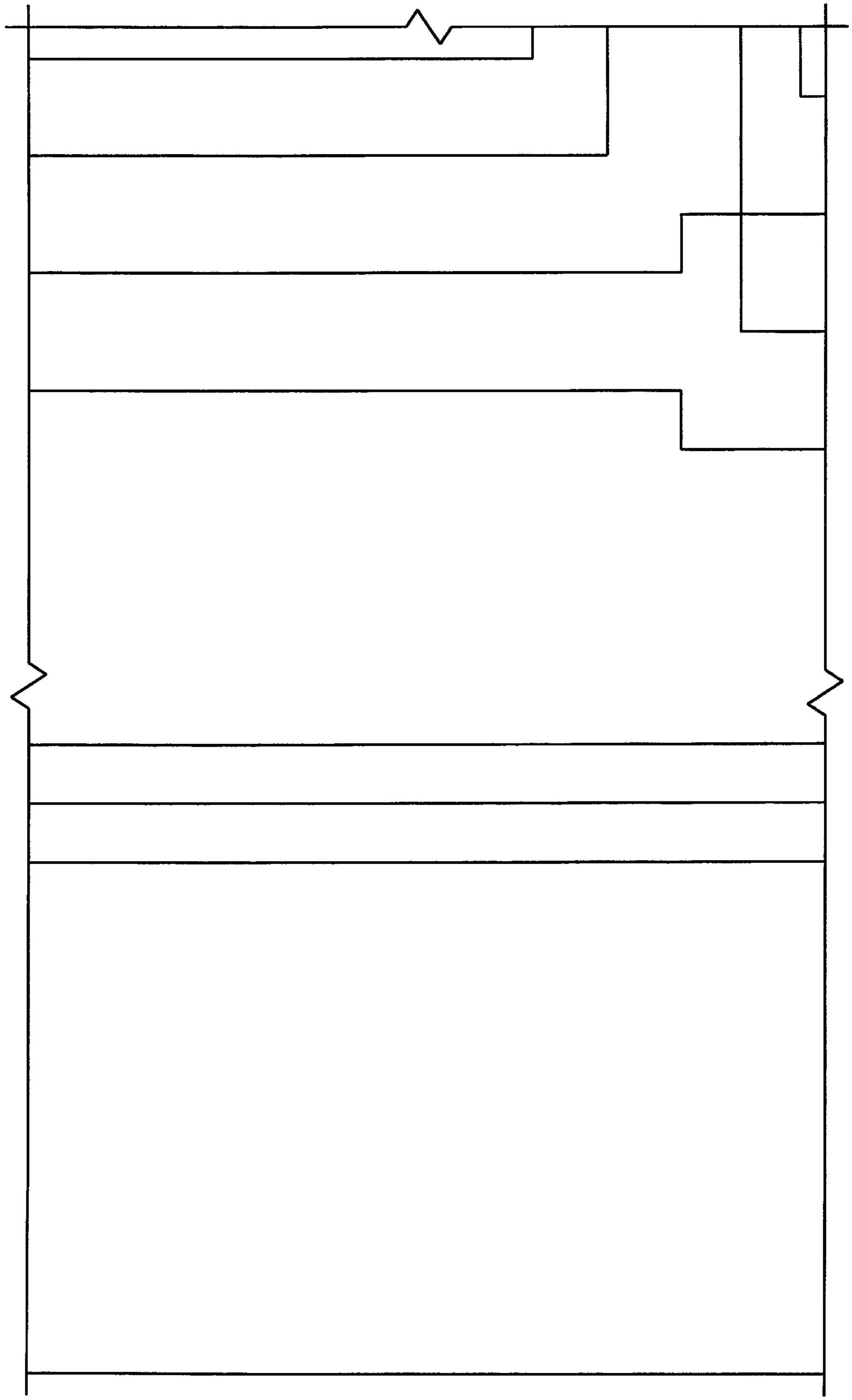
FIG. 7.15BA

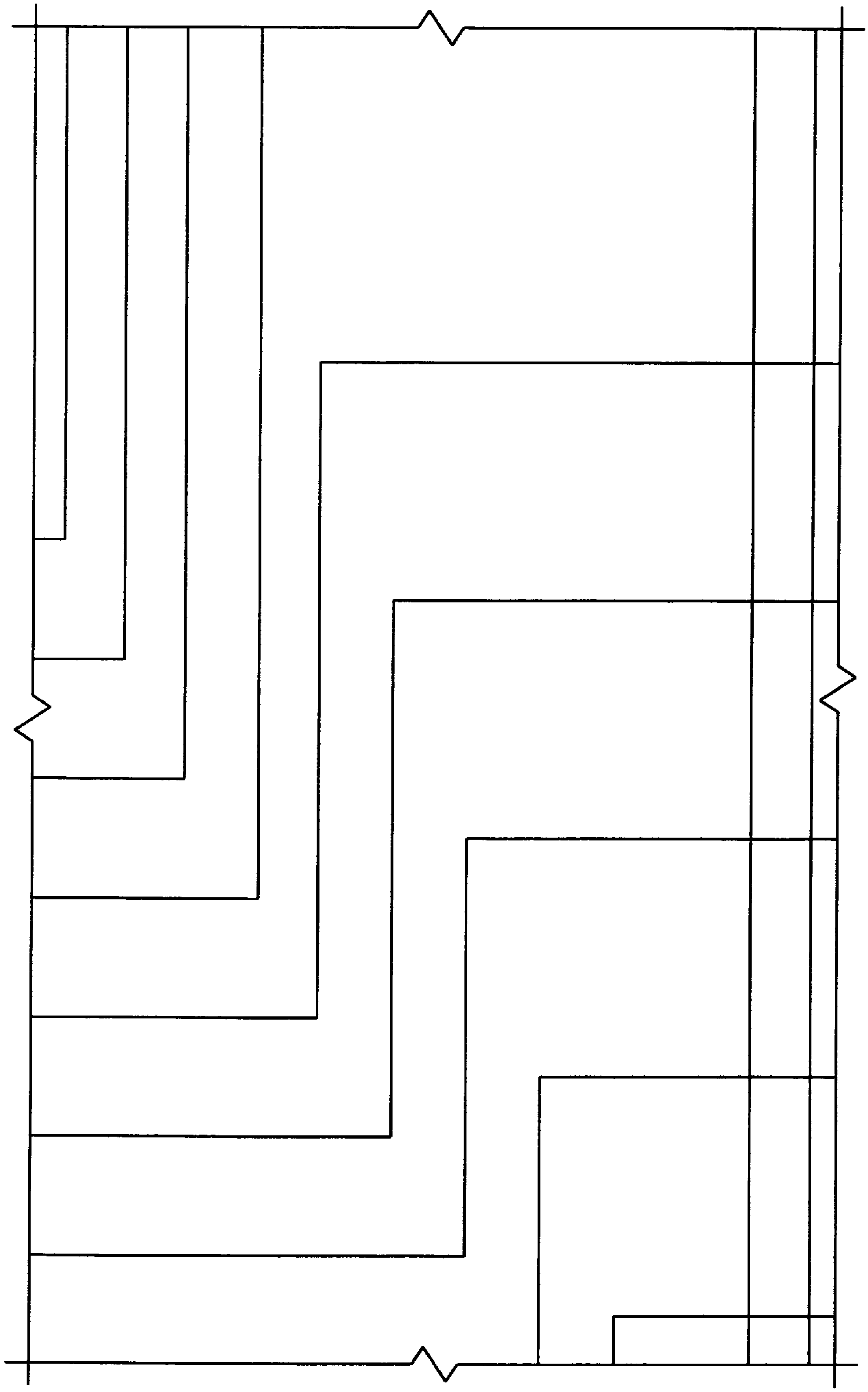
Fig. 7.15BB

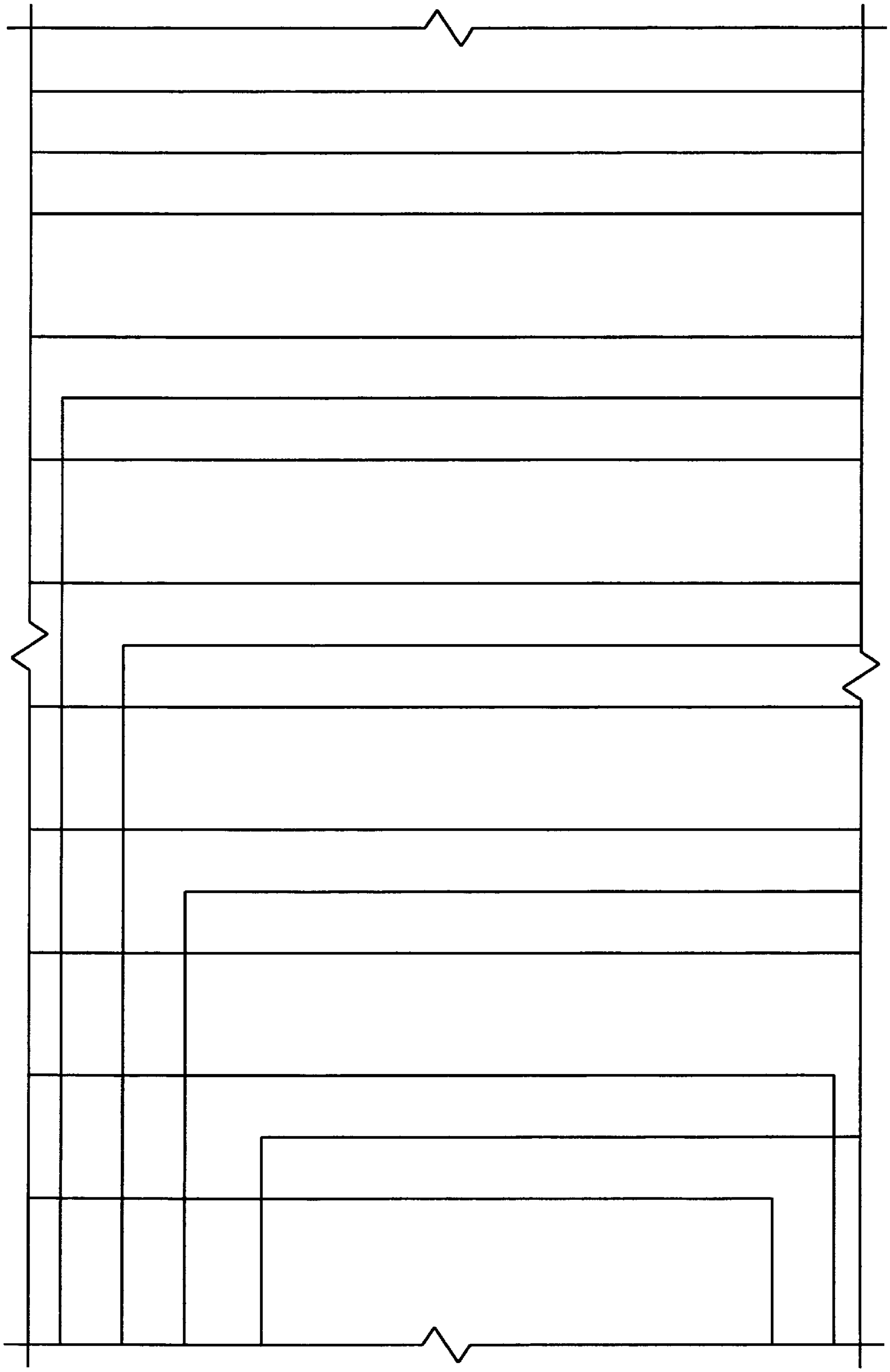
FIG. 7.15BC

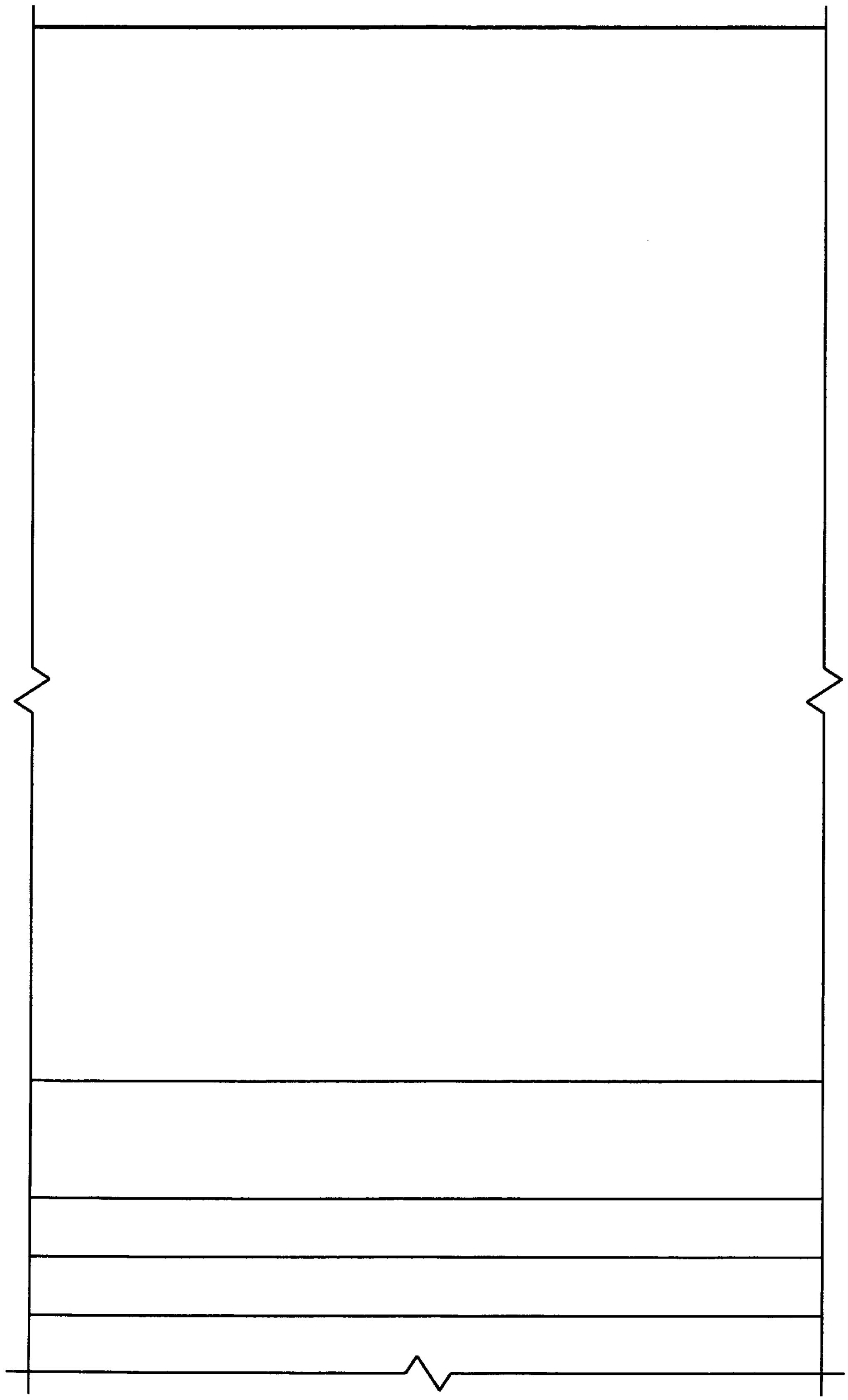
Fig. 7.15BD

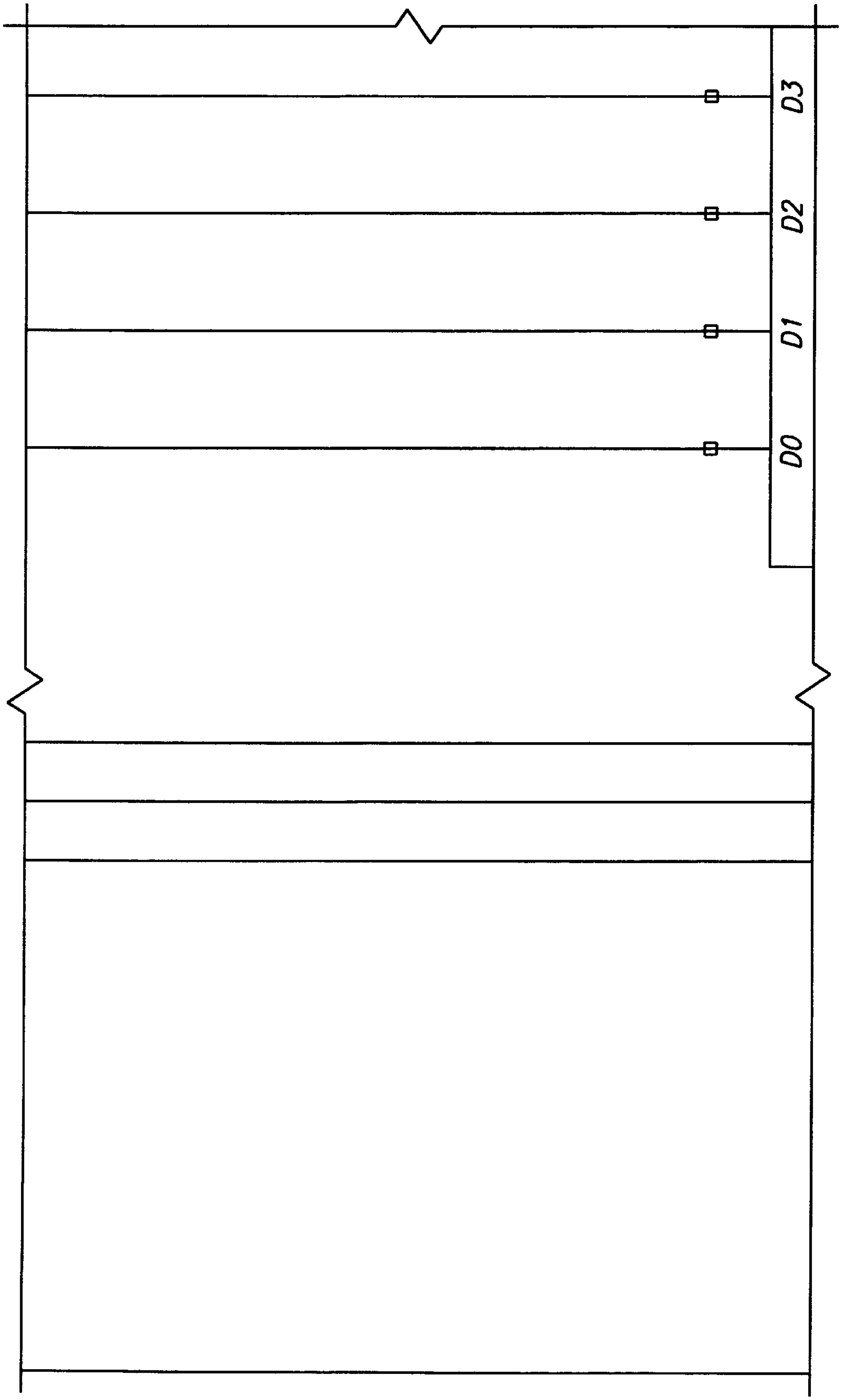
Fig. 7.15CA

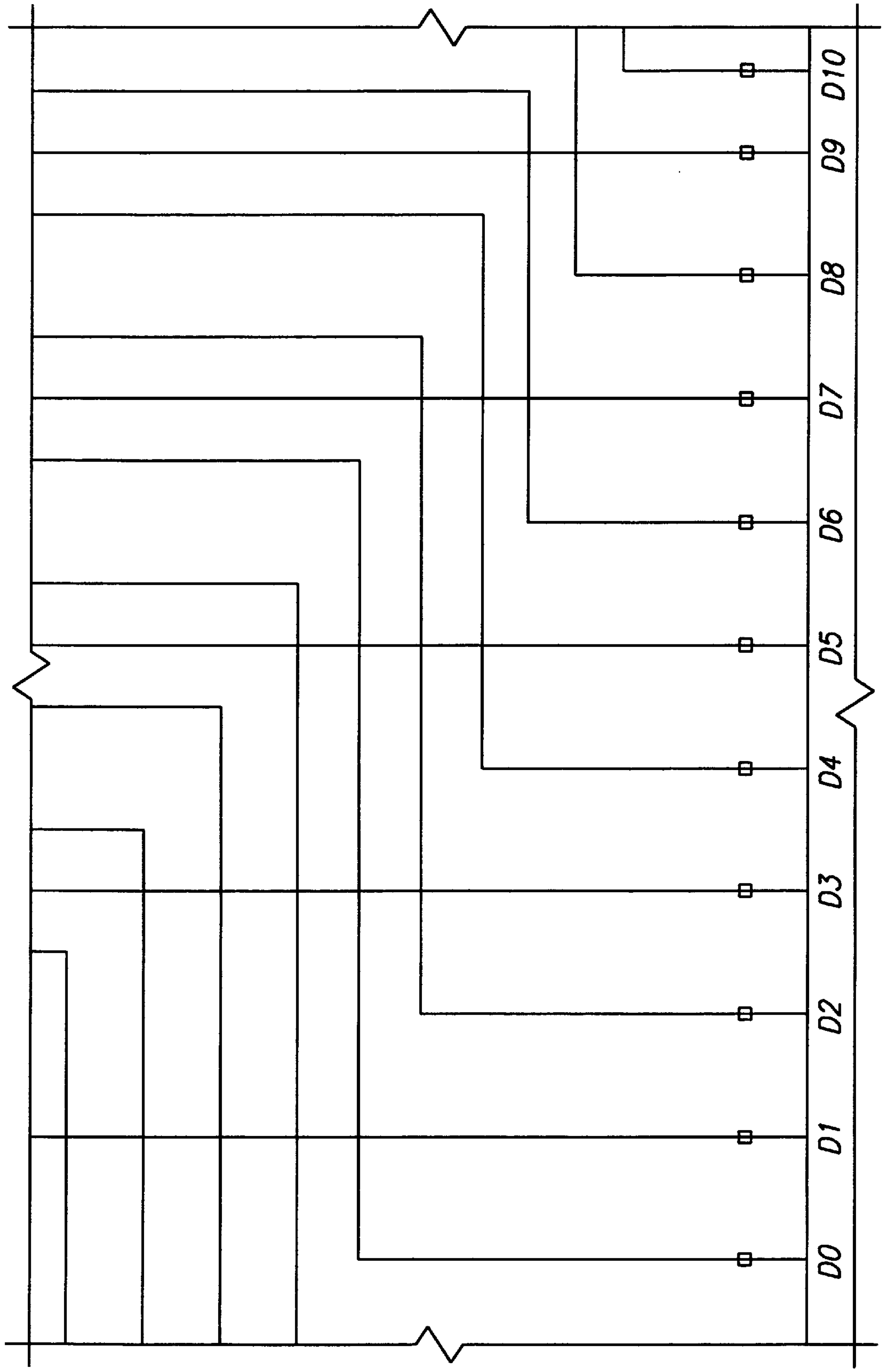
Fig. 7.15CC

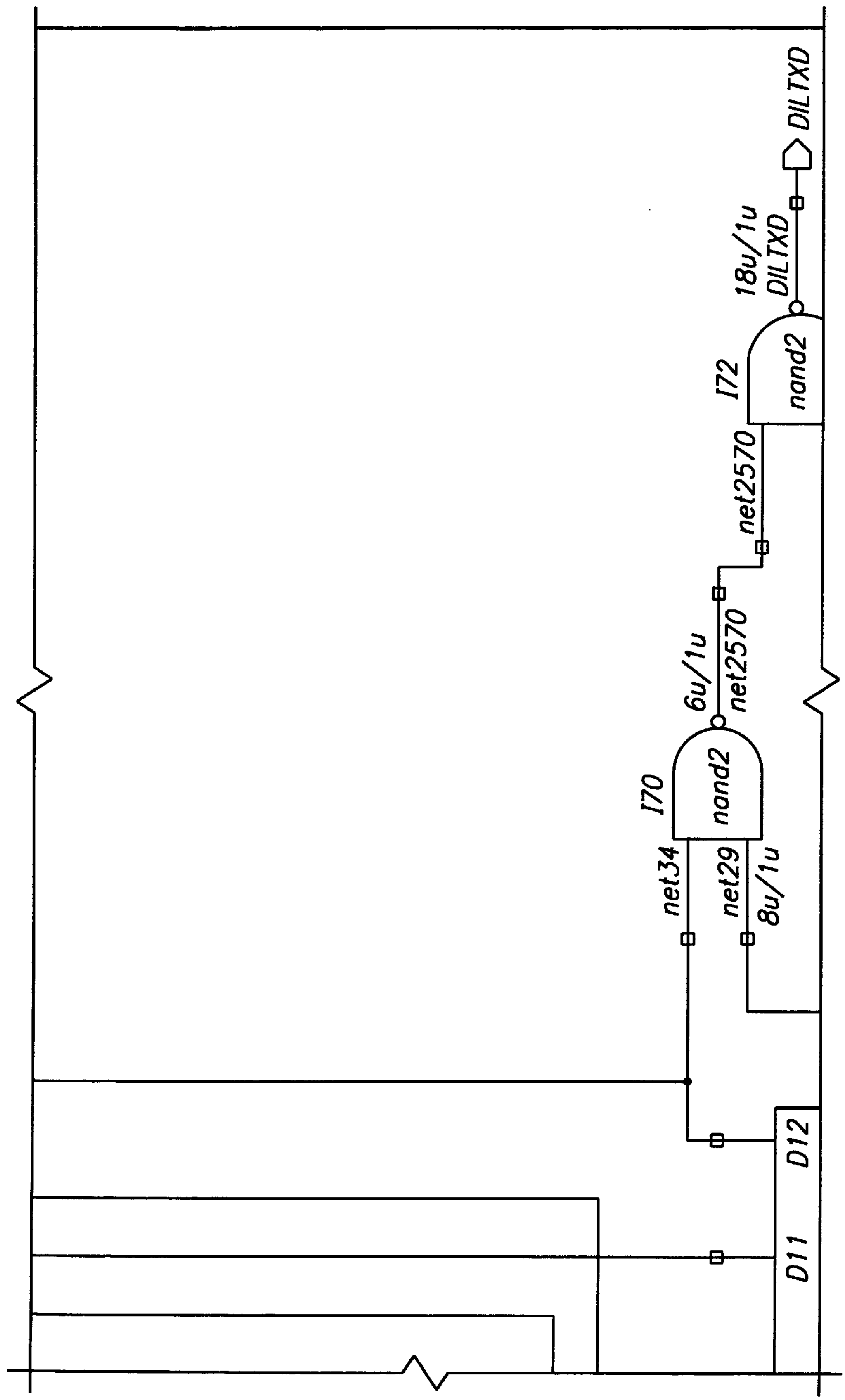
Fig. 7.15CD

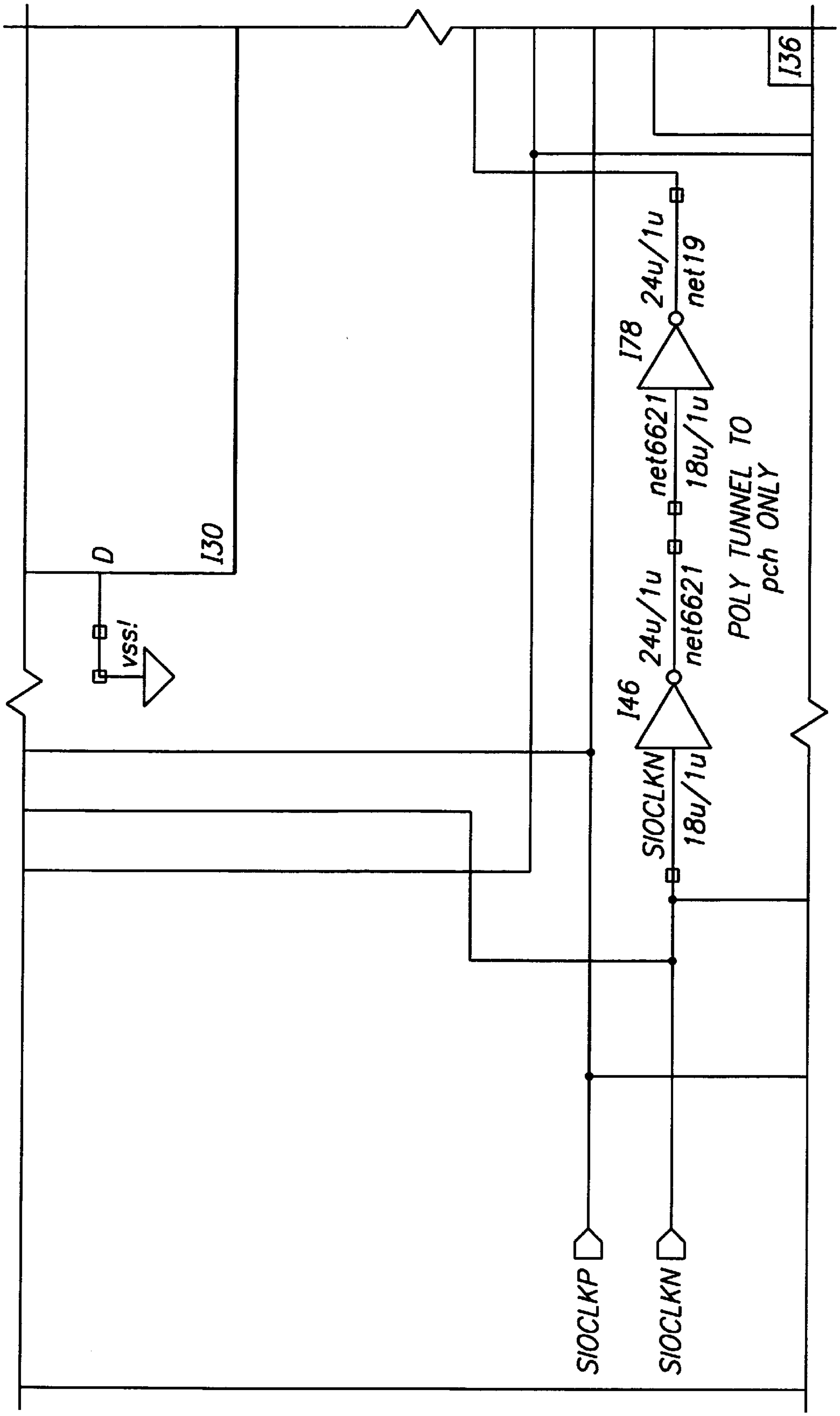
FIG. 7.15DA

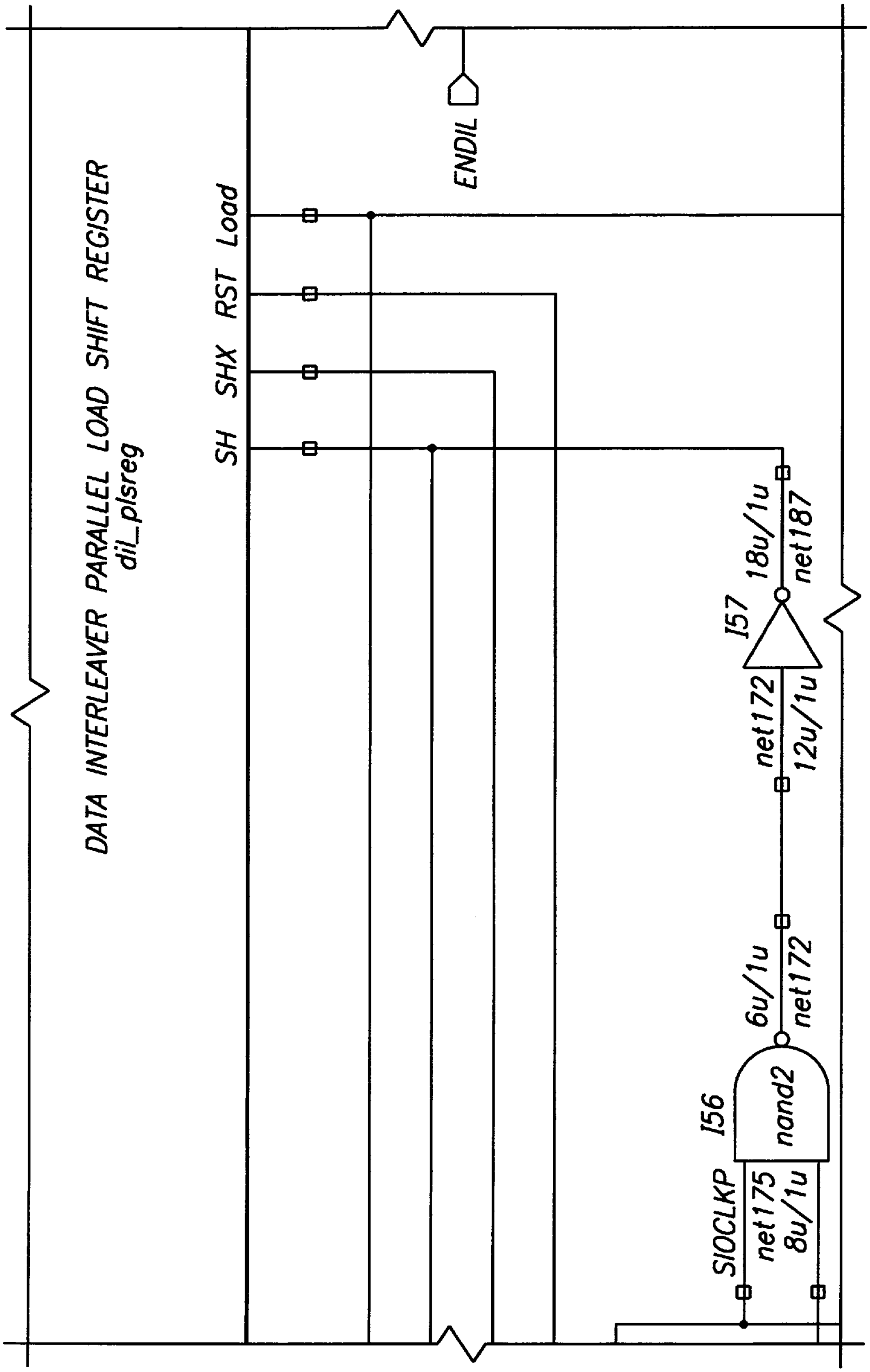
Fig. 7.15DC

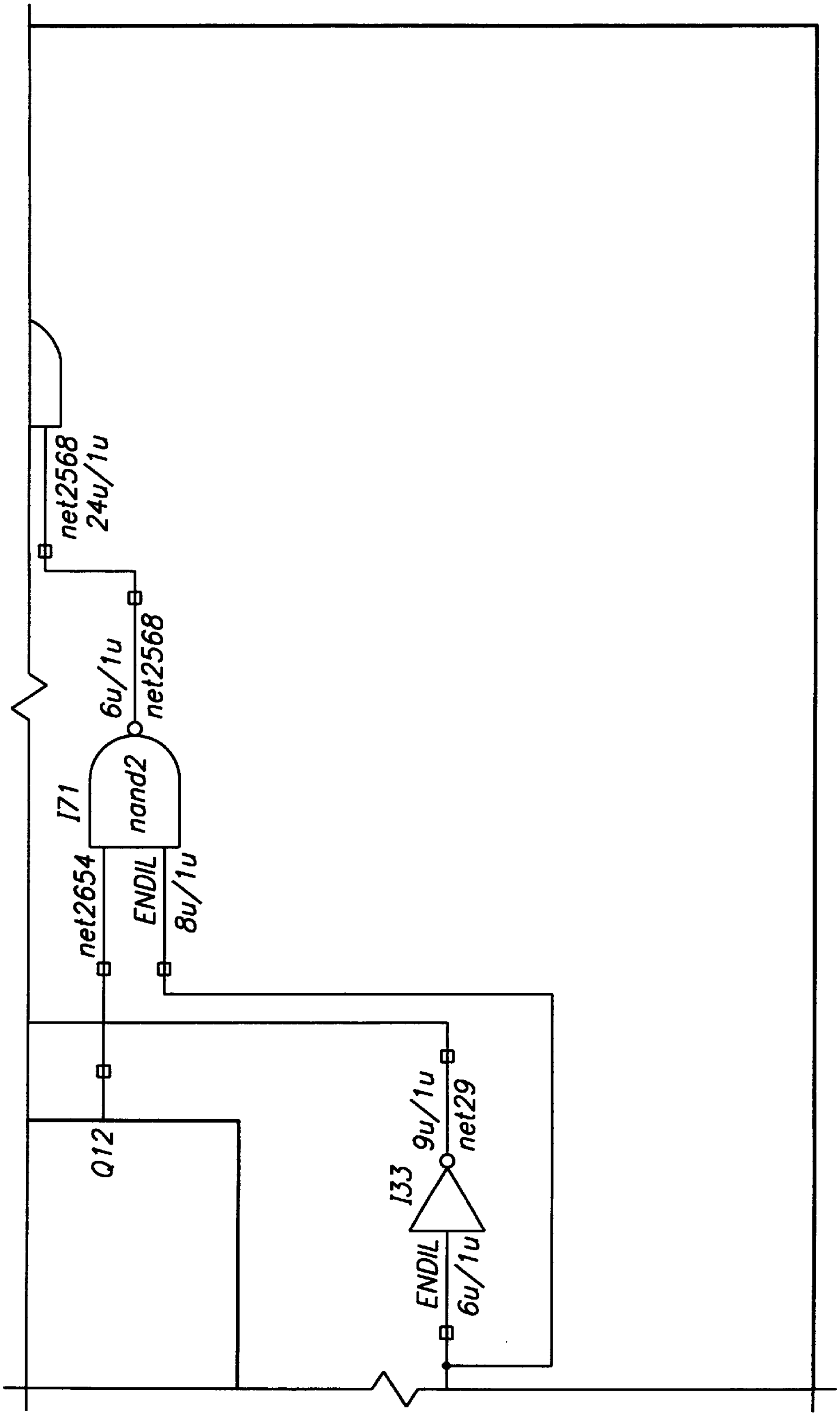
Fig 7.15DD

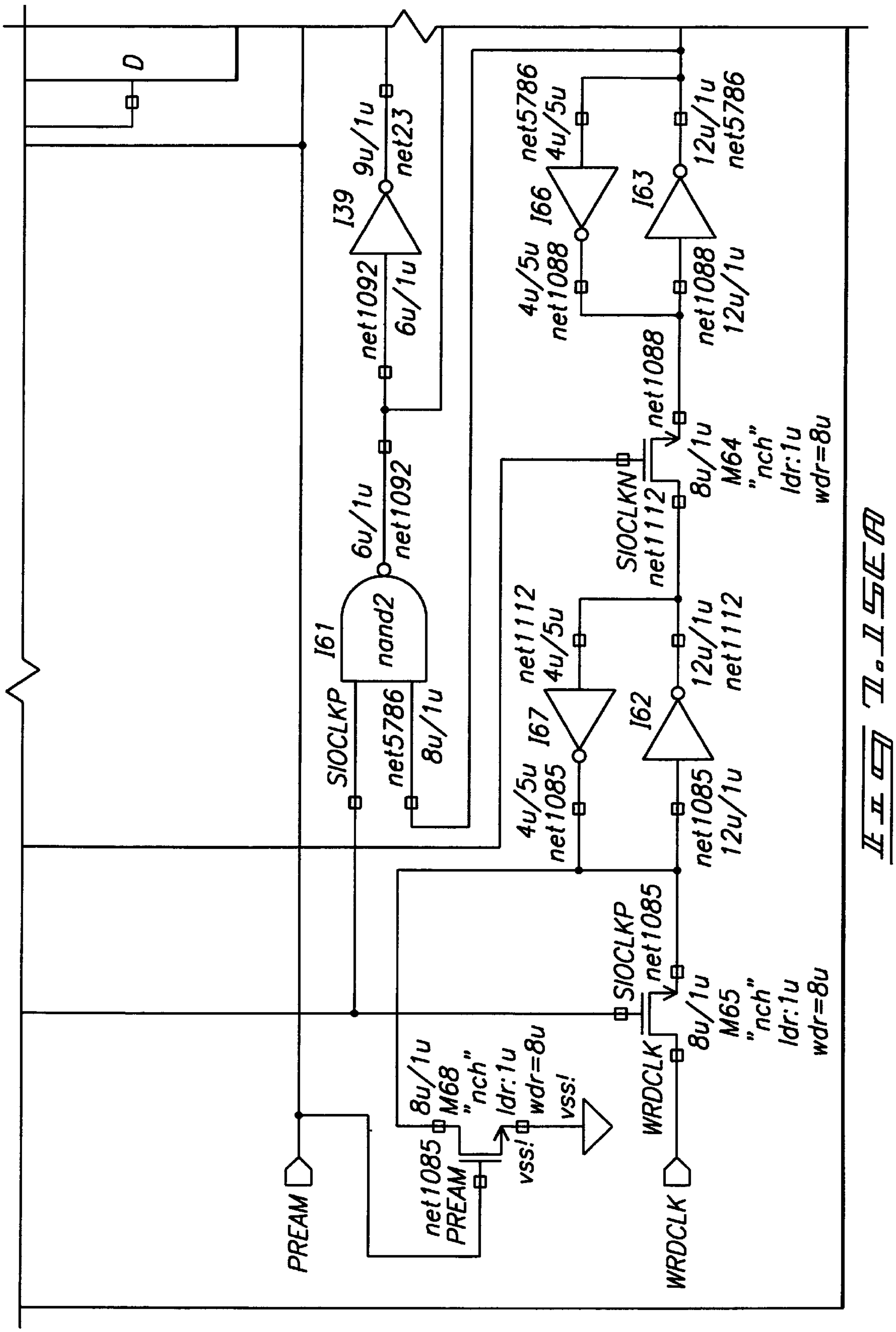
FIG 7.15EA

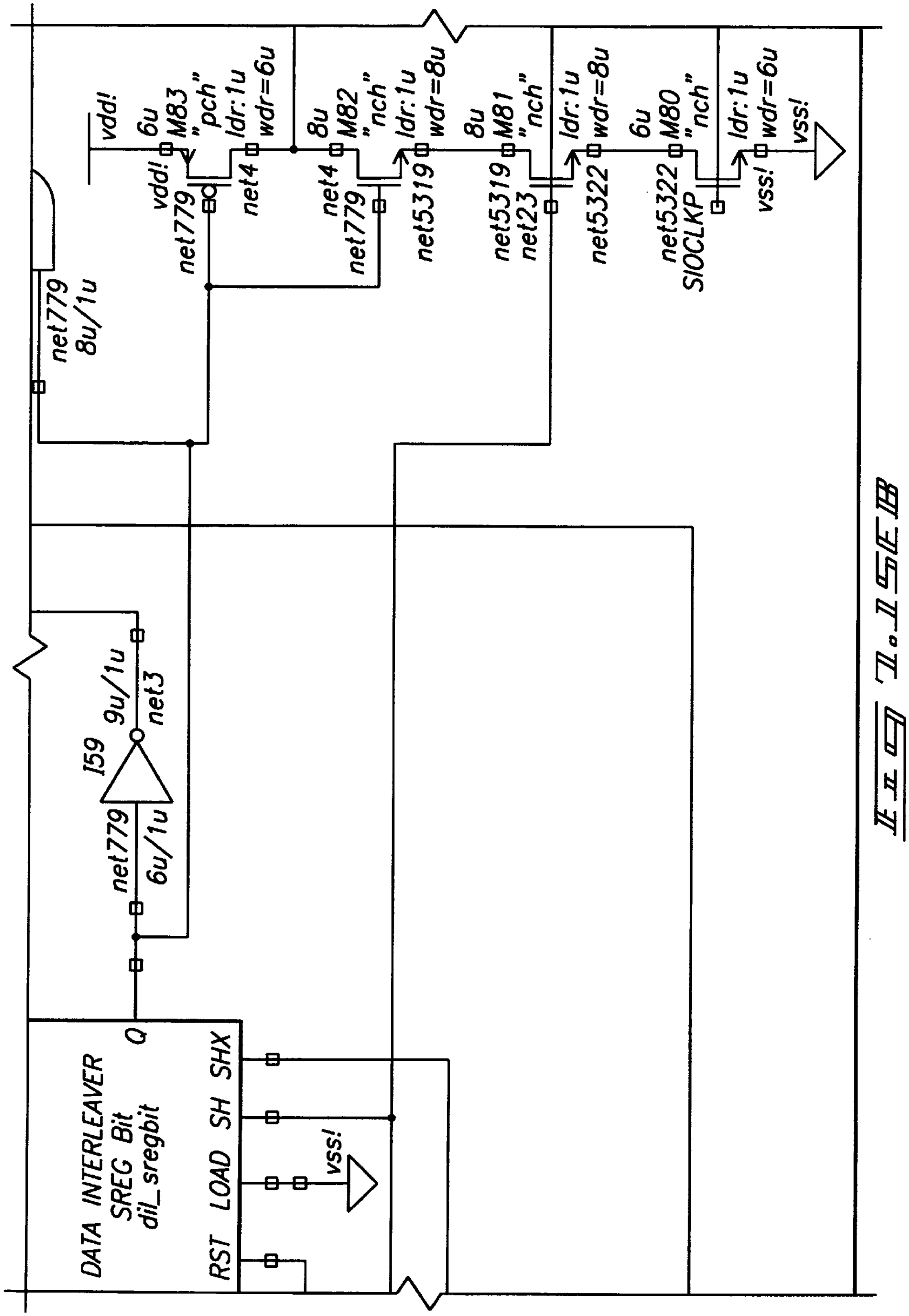
Fig 7.15EB

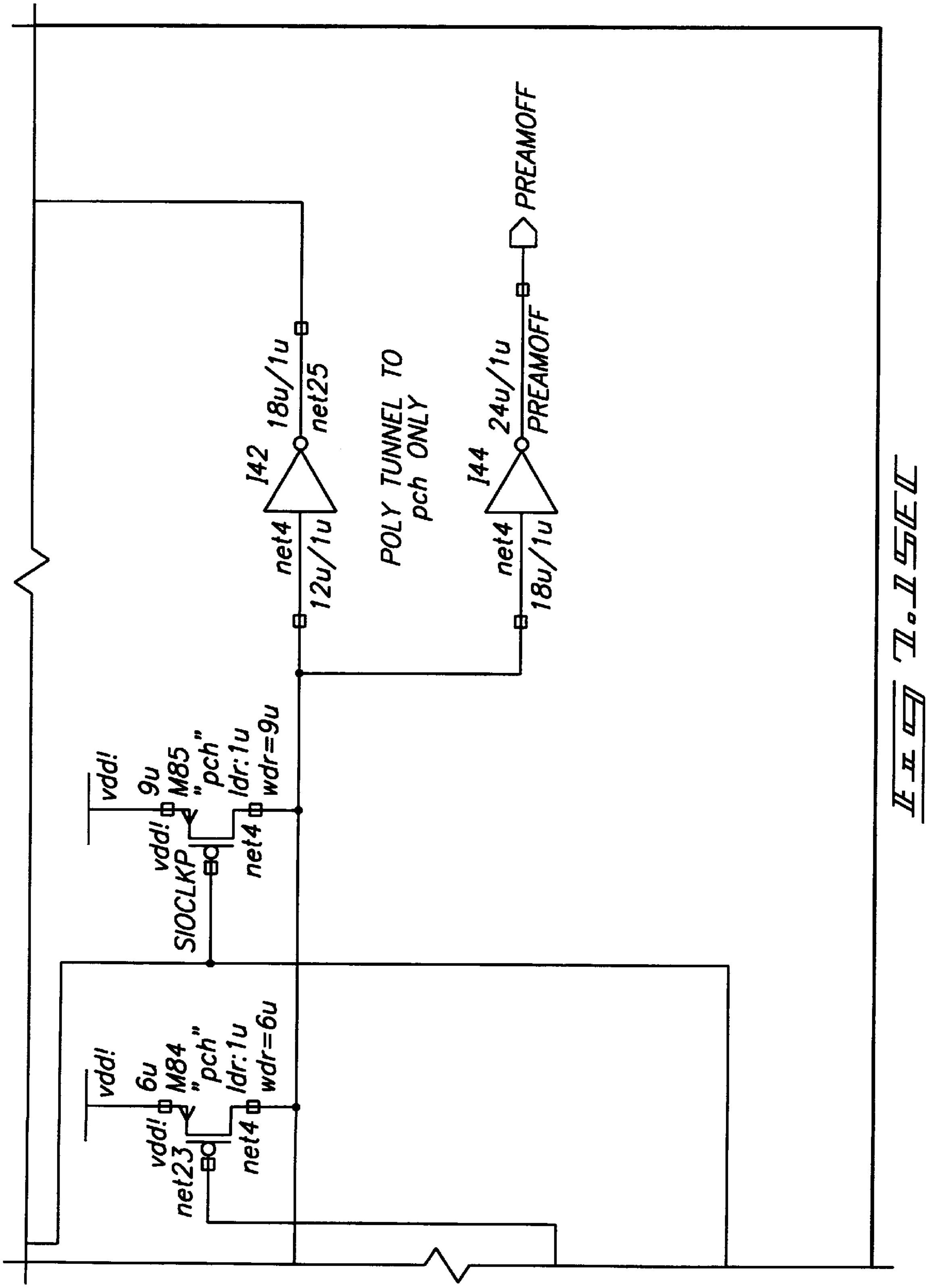
Fig 7.15EC

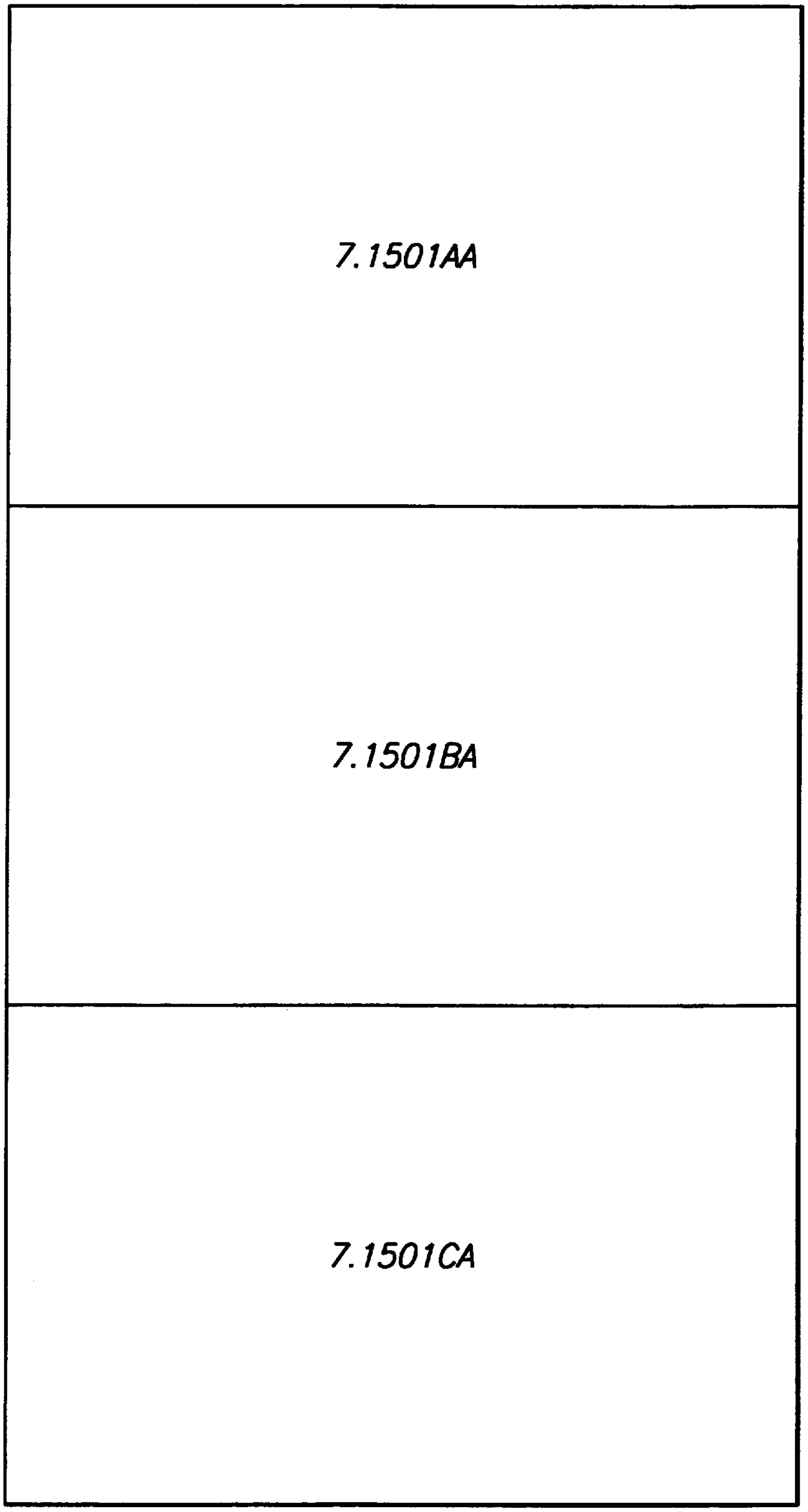
Fig 7.1501

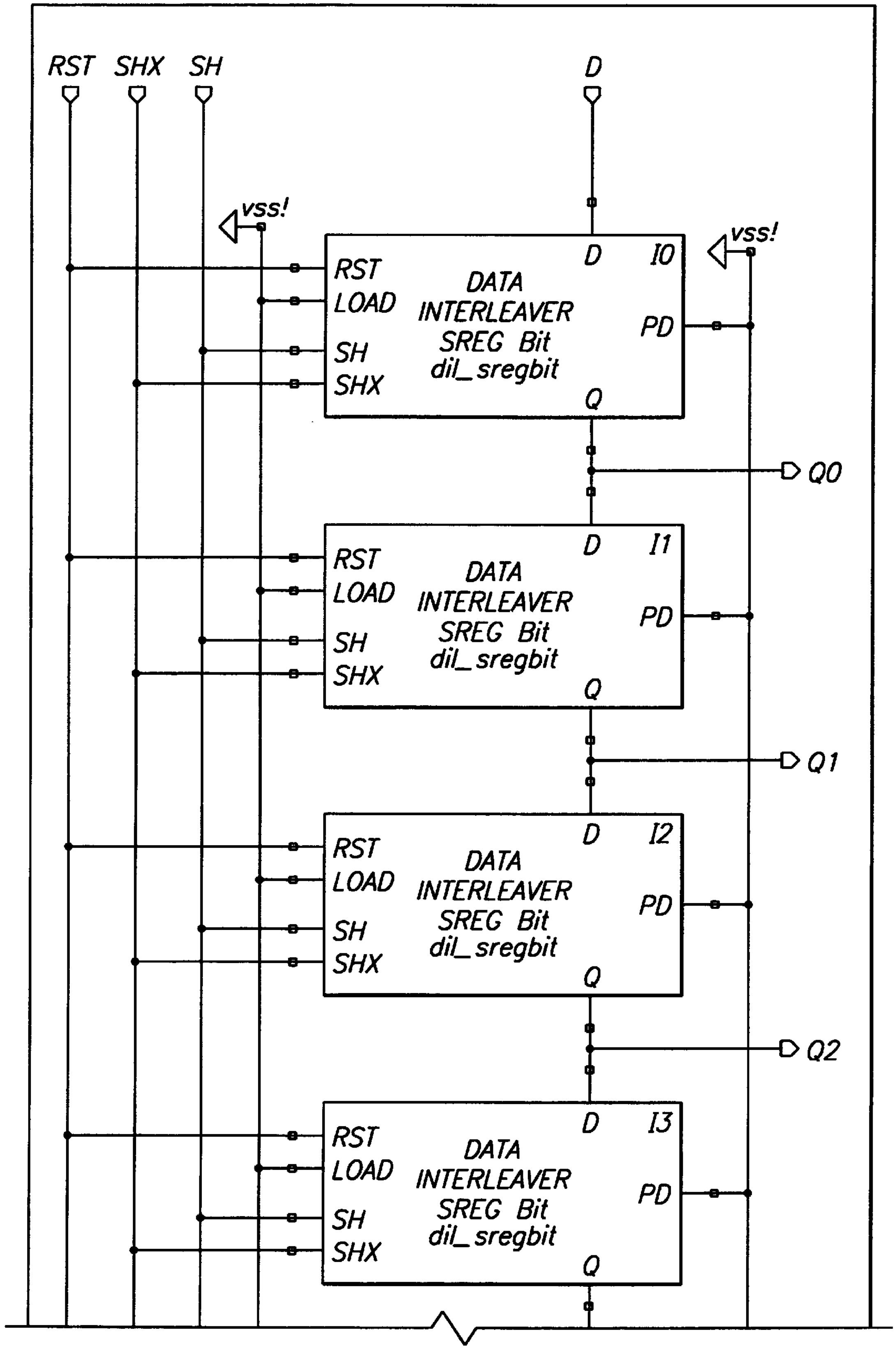
Fig 1.1501AA

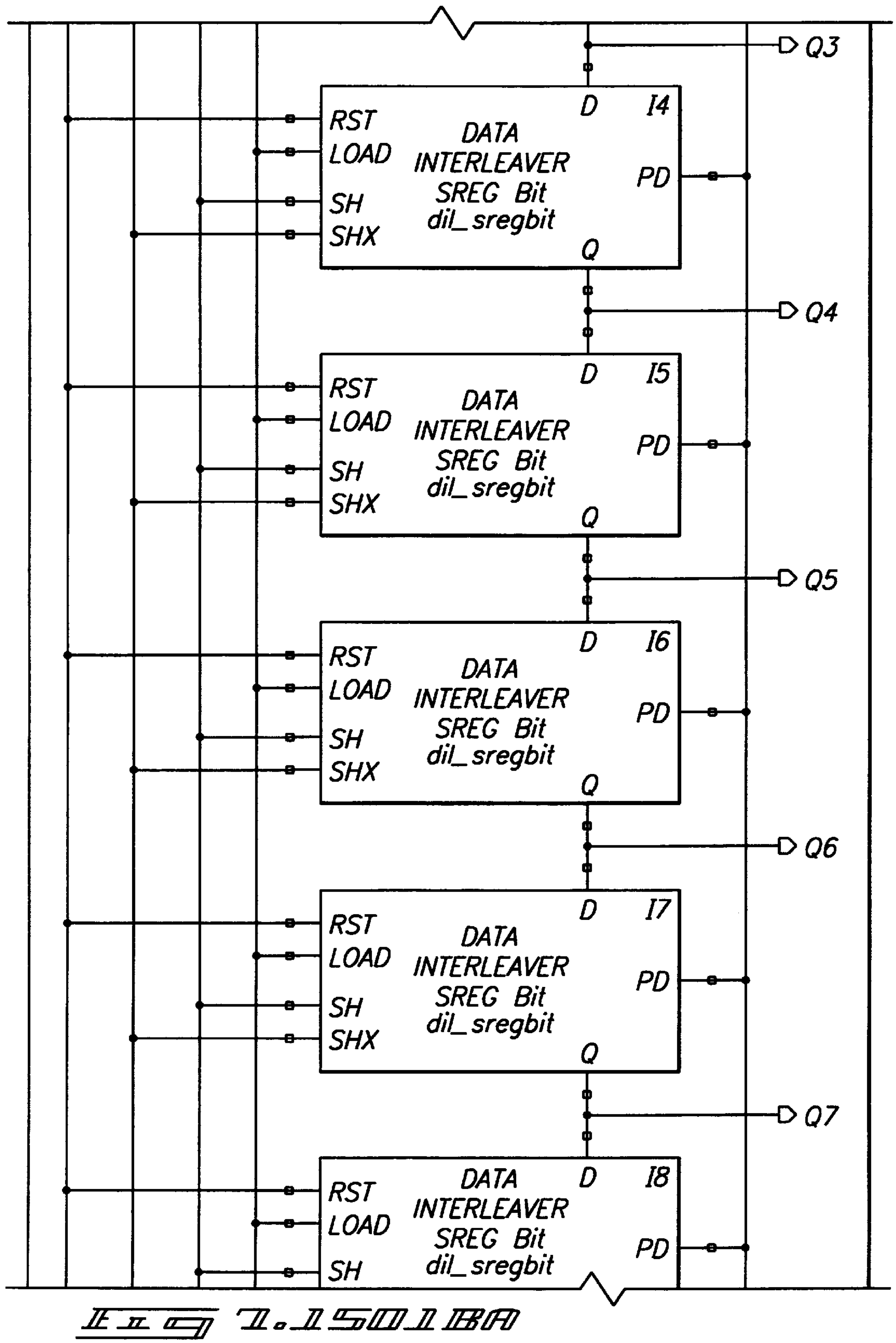
FIG 7.15018A

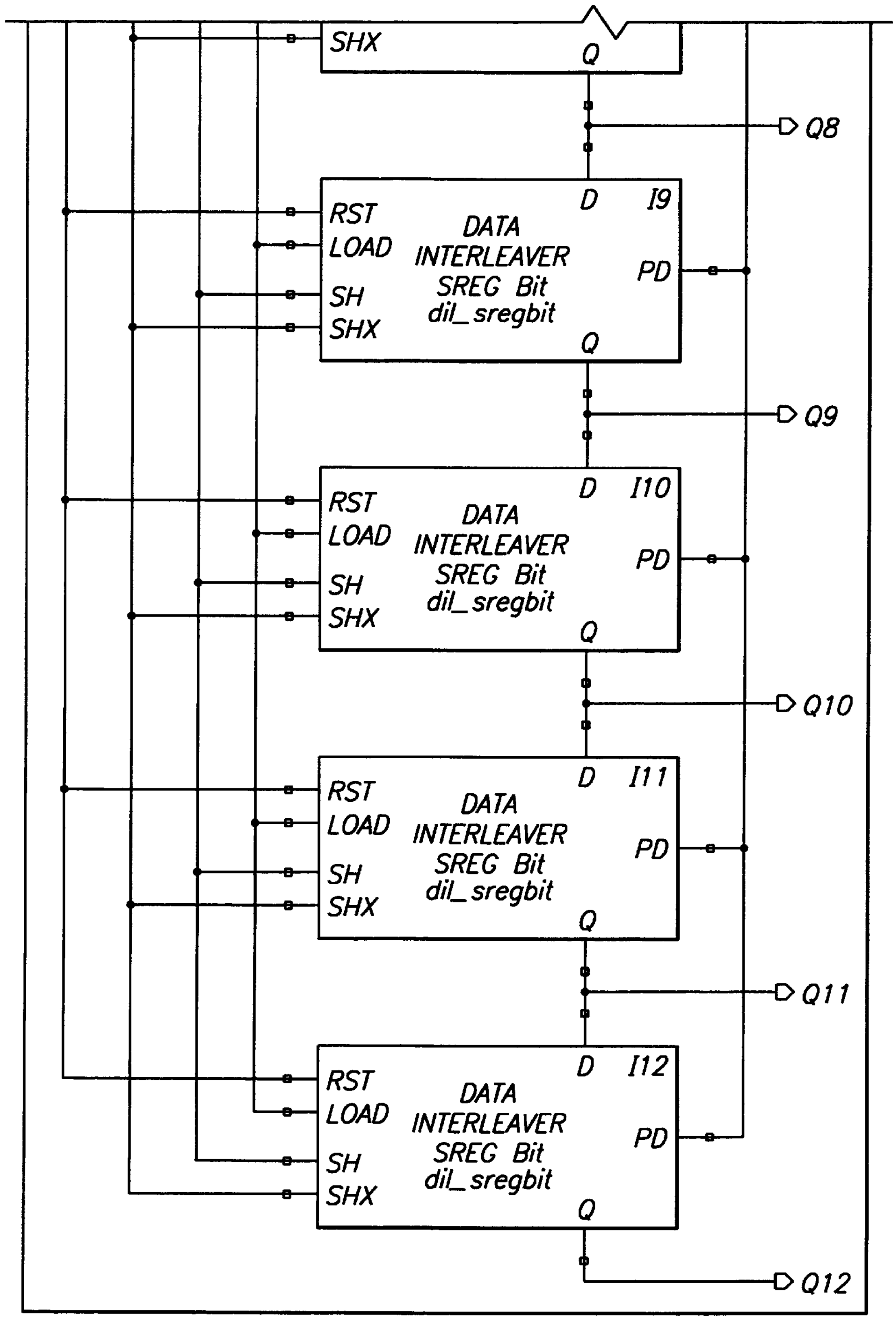
Fig 7.15O1CA

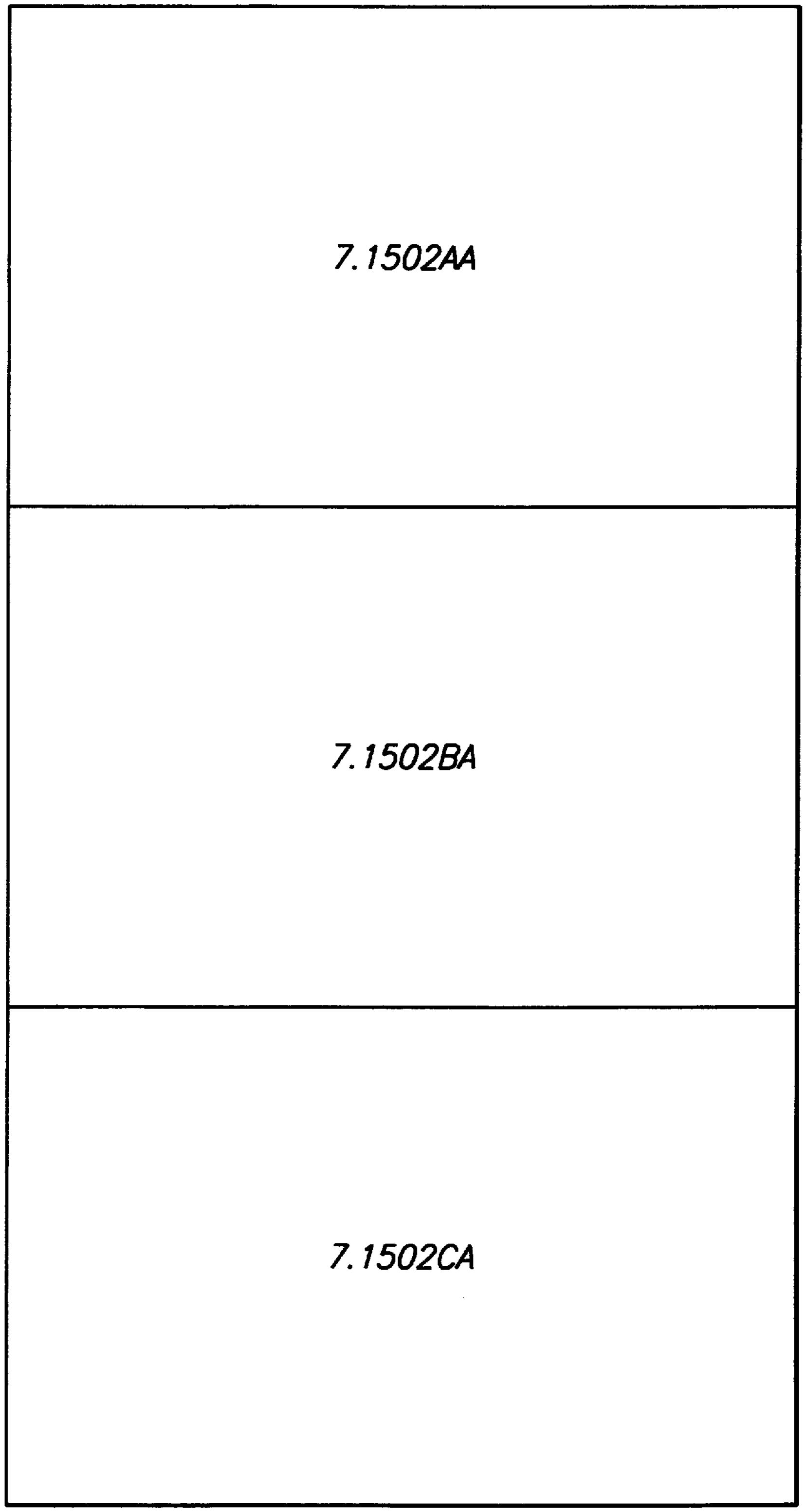
Fig 7.1502

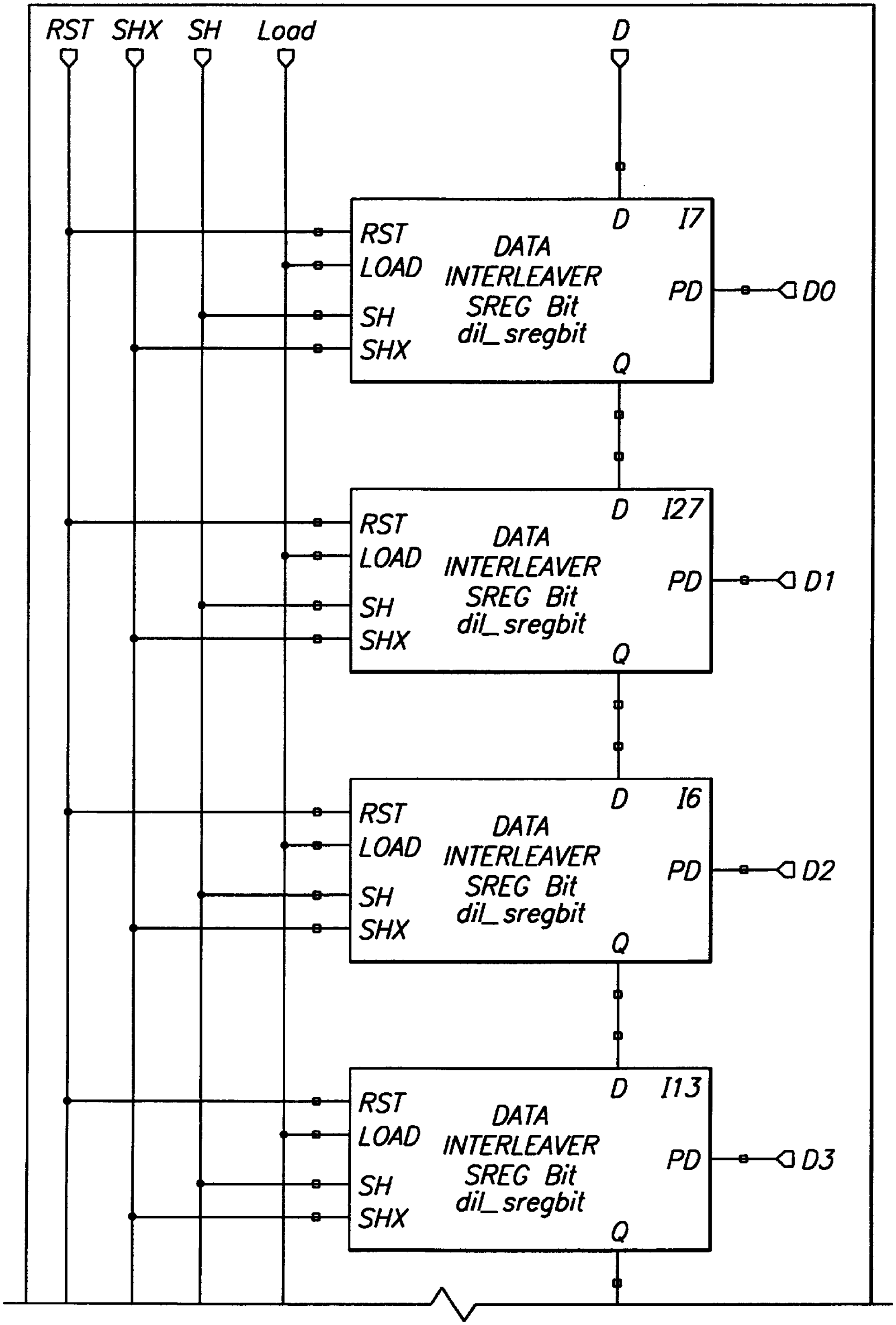
FIG 7.1502AA

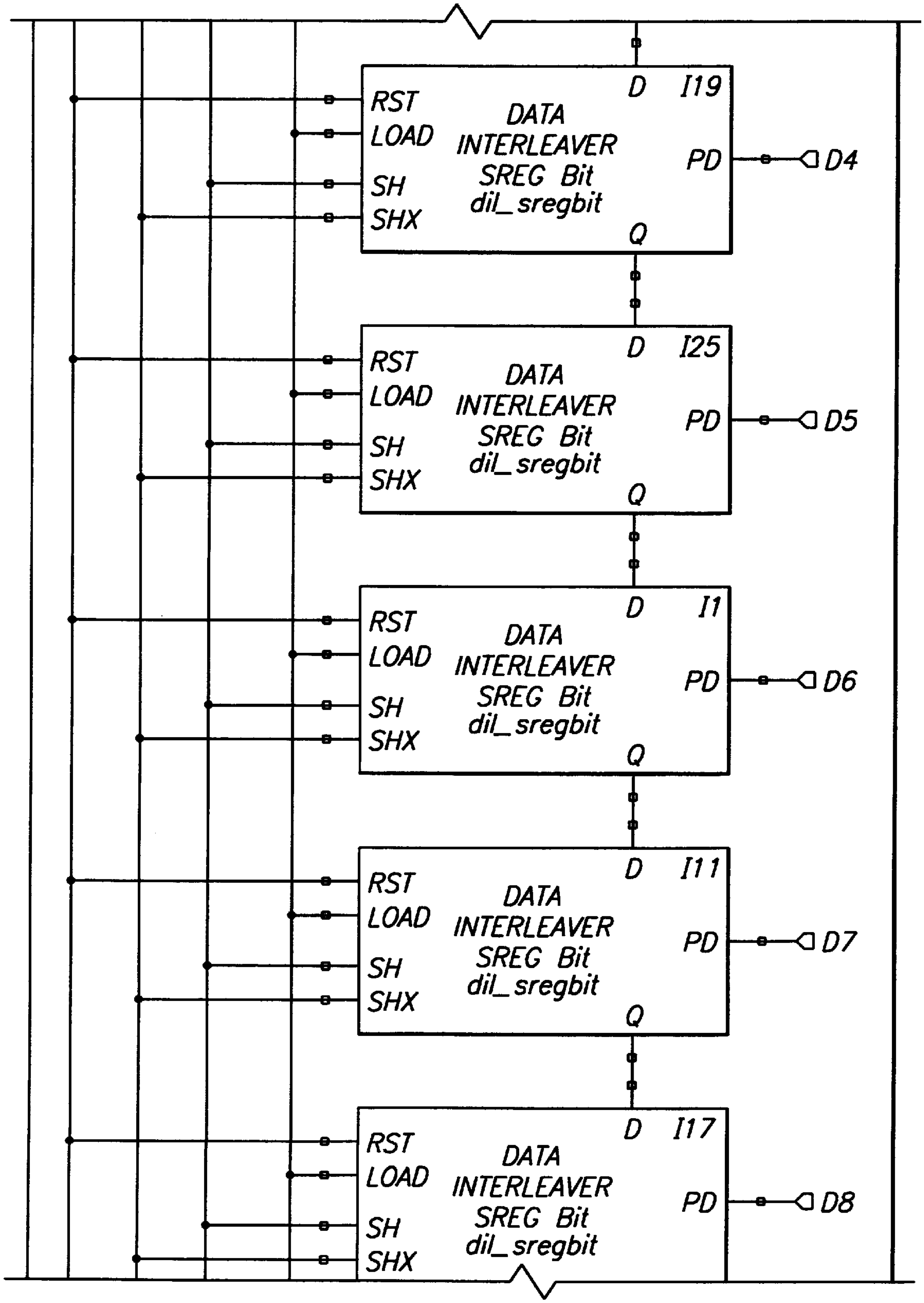
Fig 7.1502BA

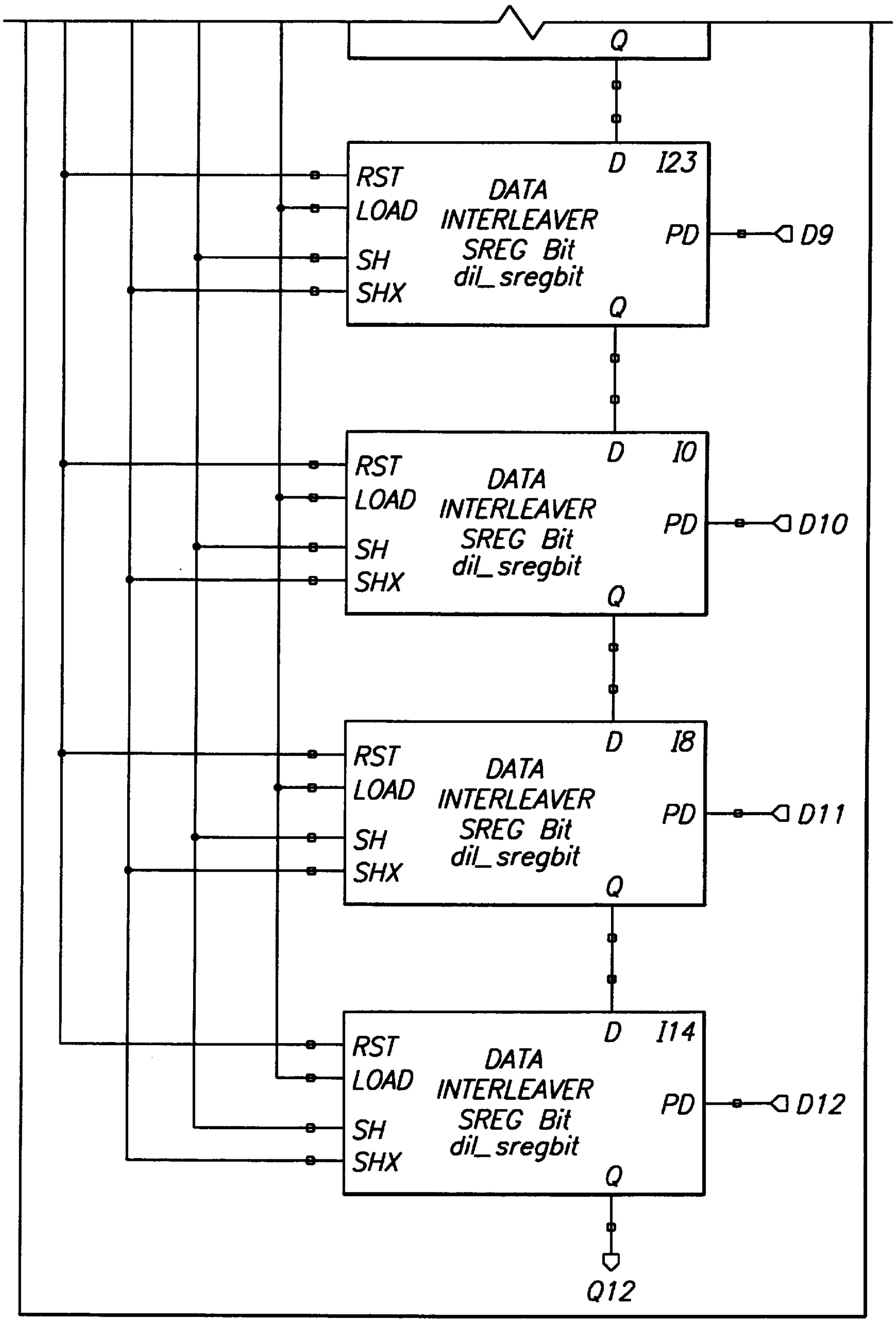
Fig 7.1502CA

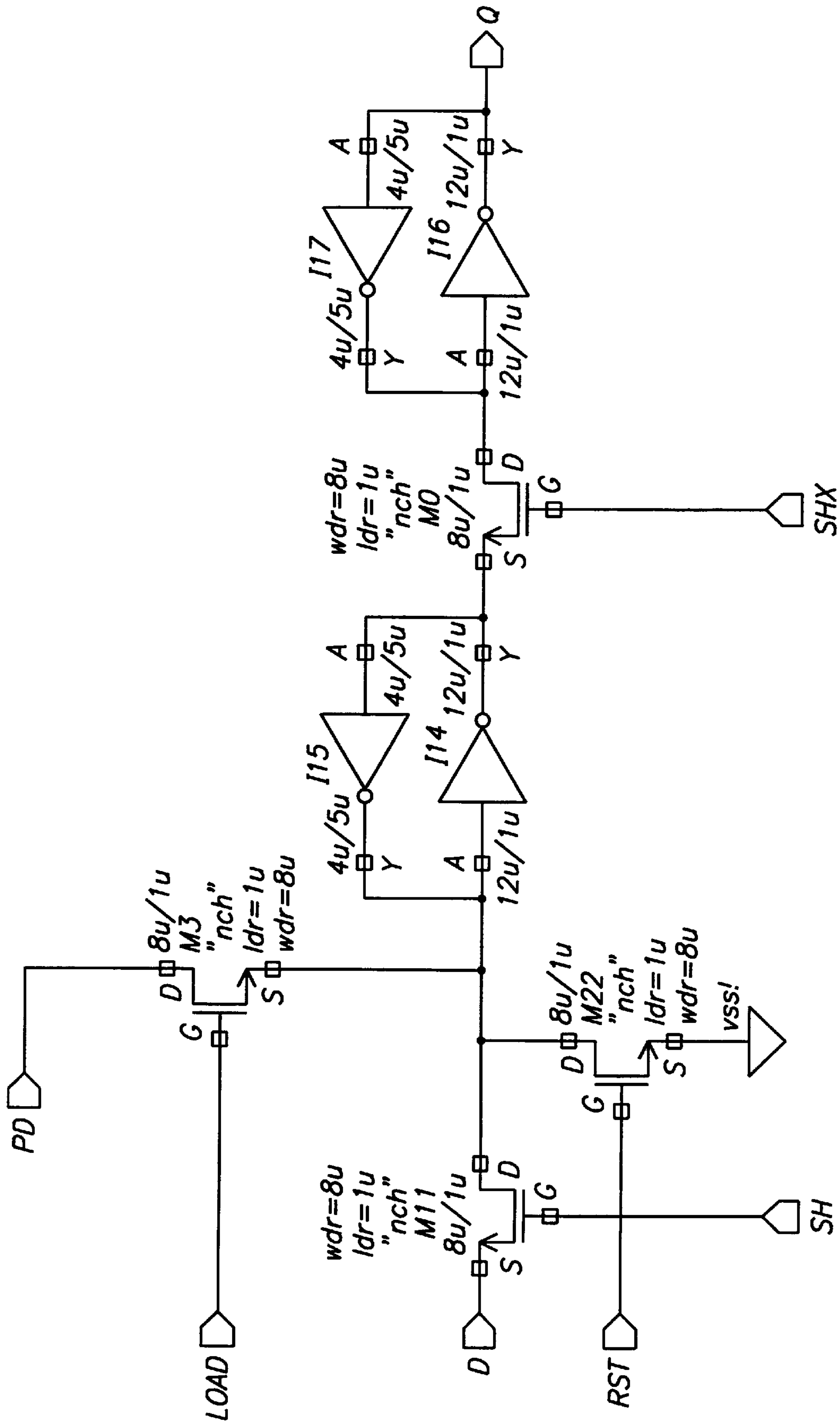
Fig. 150201

| | | | |
|---|---|---|---|
| 7.16AA | 7.16AB | 7.16AC | 7.16AD |
| 7.16BA | 7.16BB | 7.16BC | 7.16BD |
| 7.16CA | 7.16CB | 7.16CC | 7.16CD |

FIG. 7.16

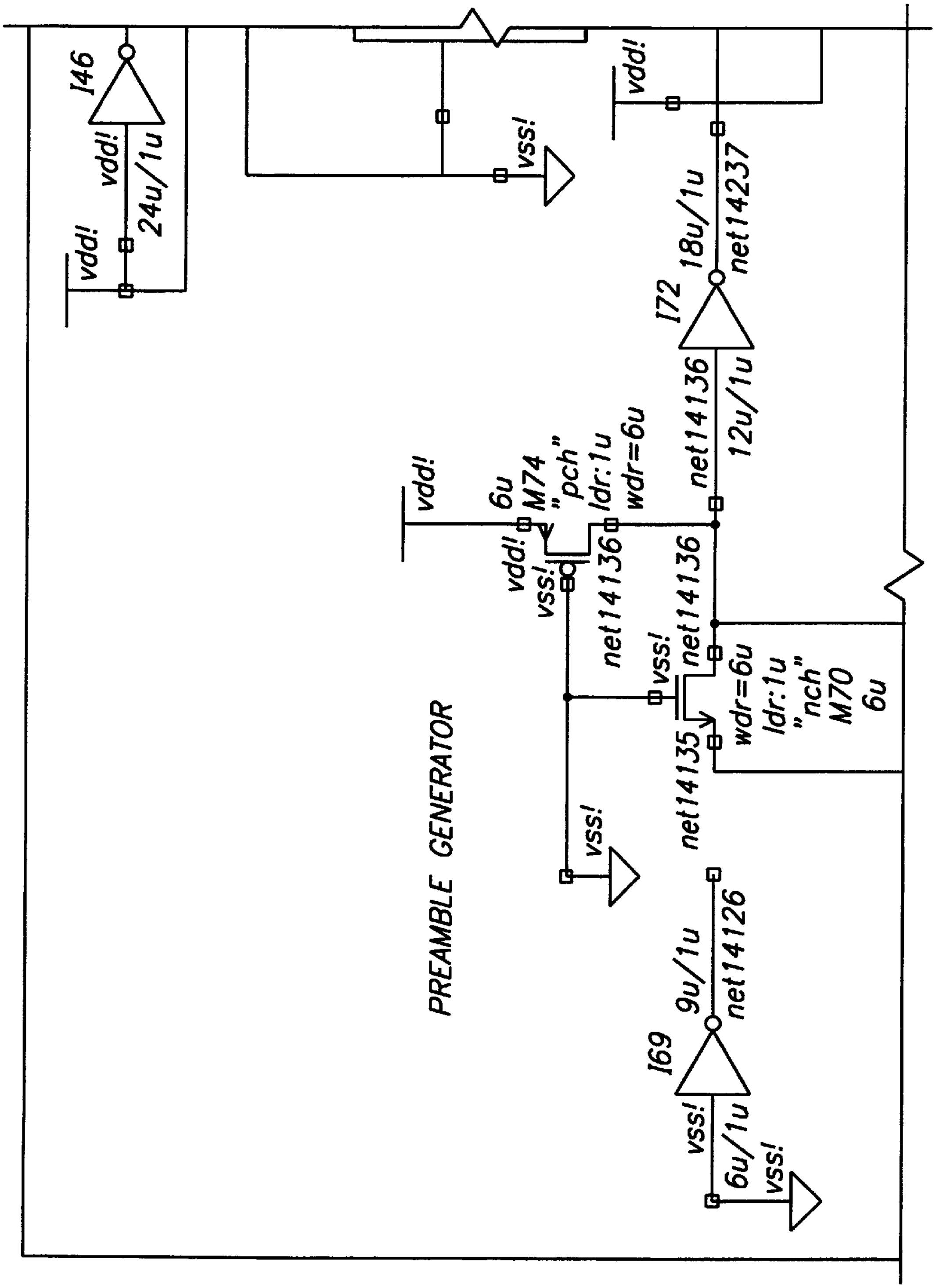
FIG. 7.16AA

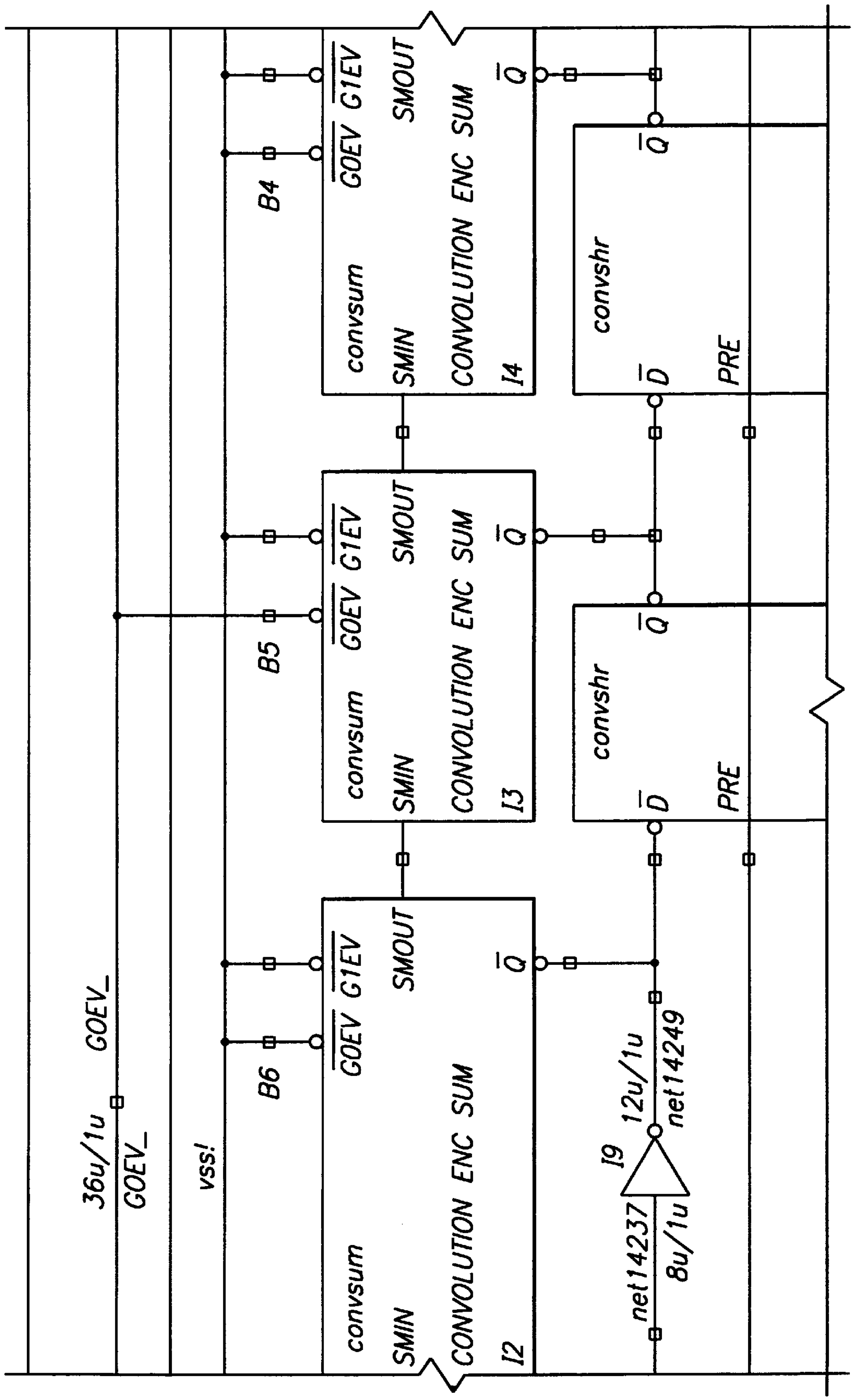
Fig. 7.16AB

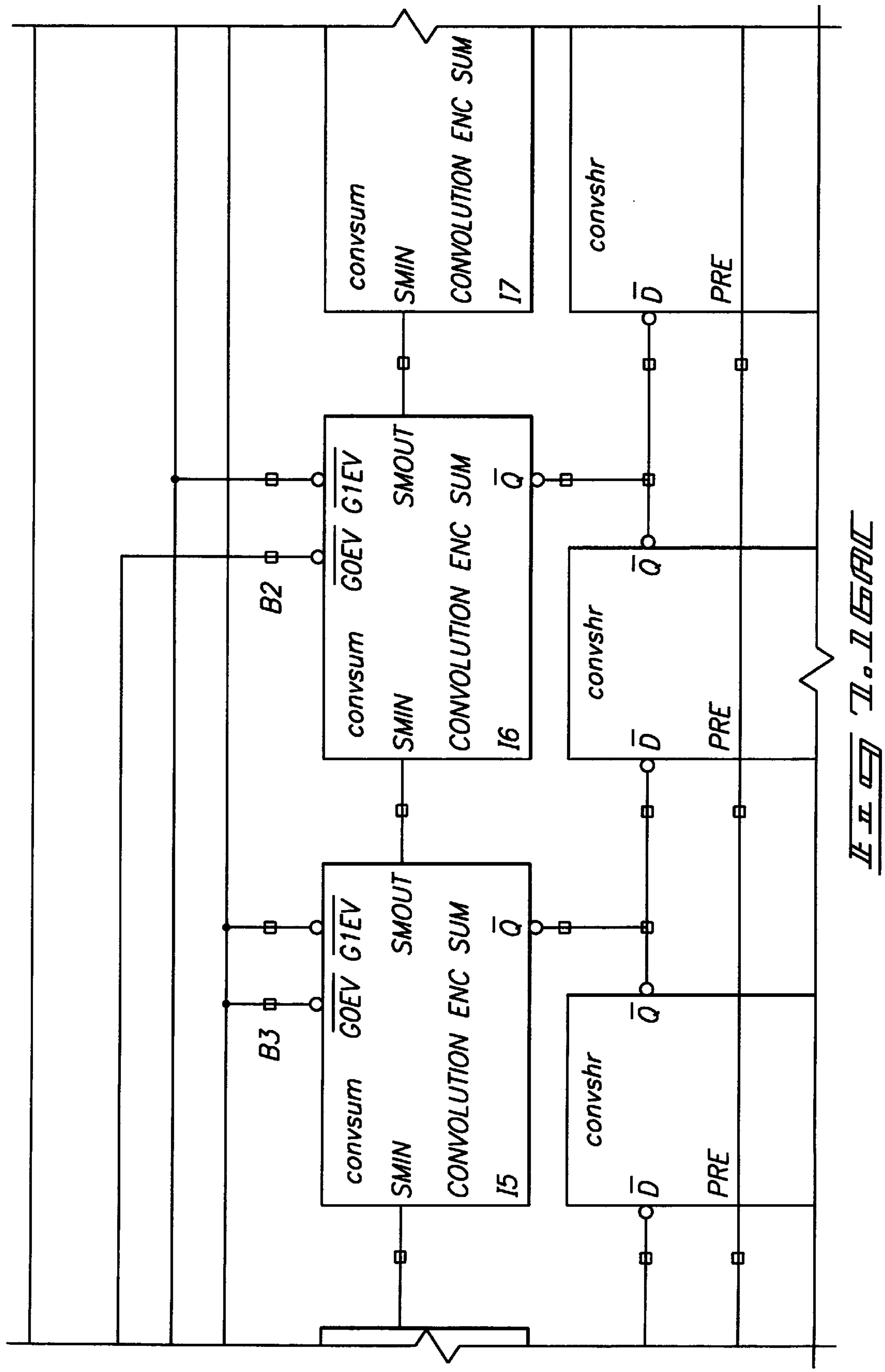
convsum
SMIN
CONVOLUTION ENC SUM
I7
convshr
D
PRE
B2
G0EV G1EV
SMOUT
Q
convsum
SMIN
CONVOLUTION ENC SUM
I6
convshr
Q
D
PRE
B3
G0EV G1EV
SMOUT
Q
convsum
SMIN
CONVOLUTION ENC SUM
I5
convshr
Q
D
PRE

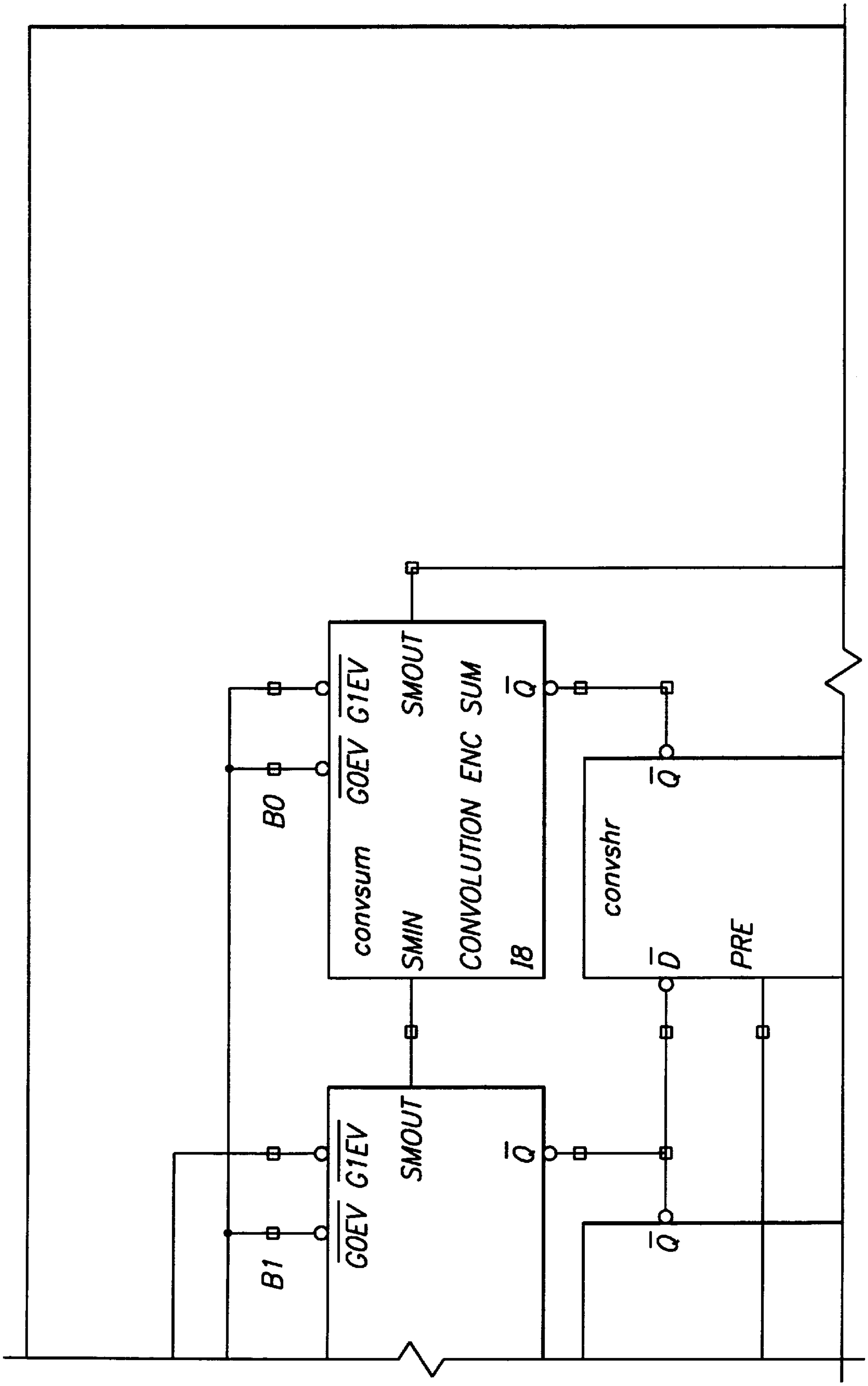
Fig. 7.16AD

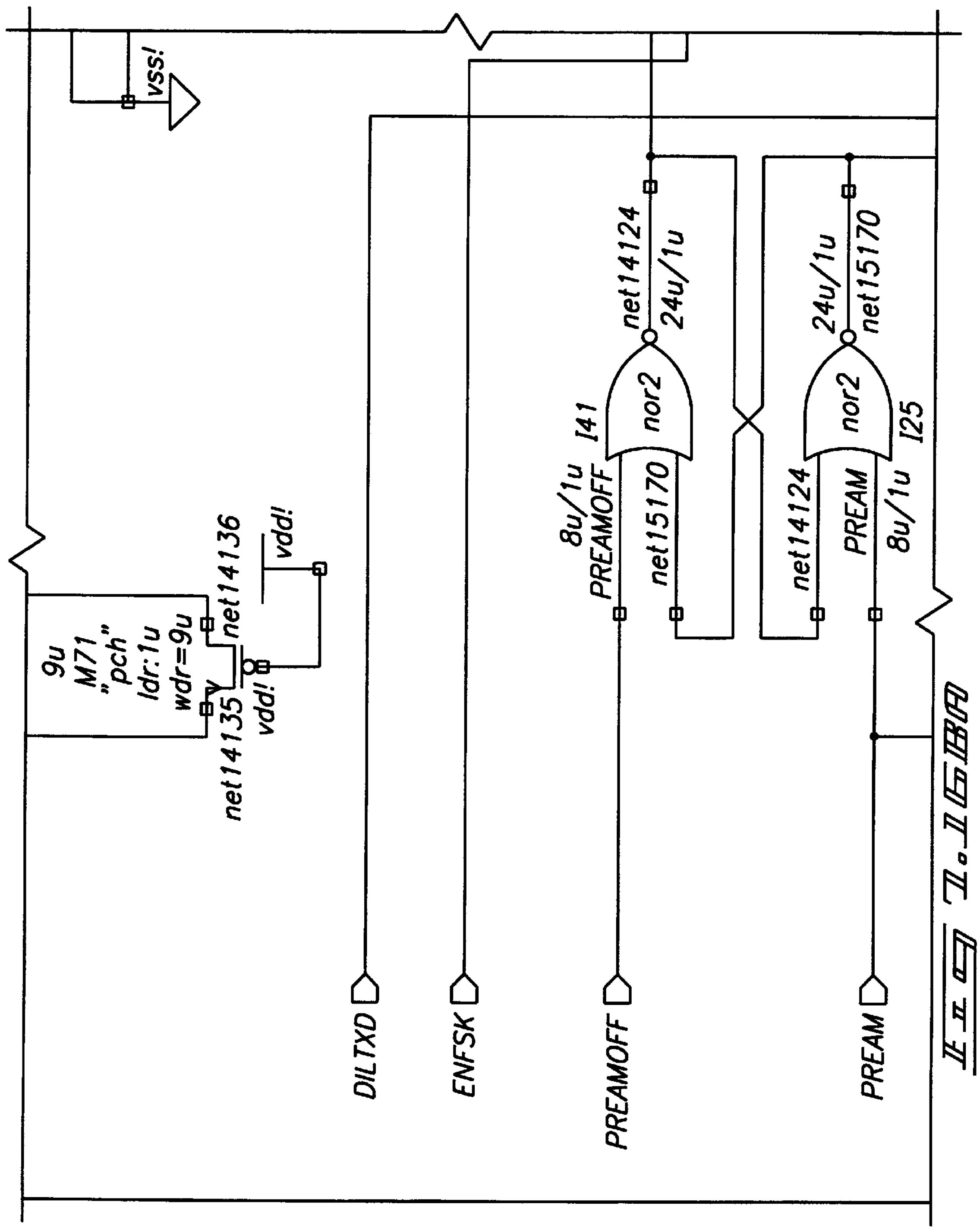
FIG. 7.16BA

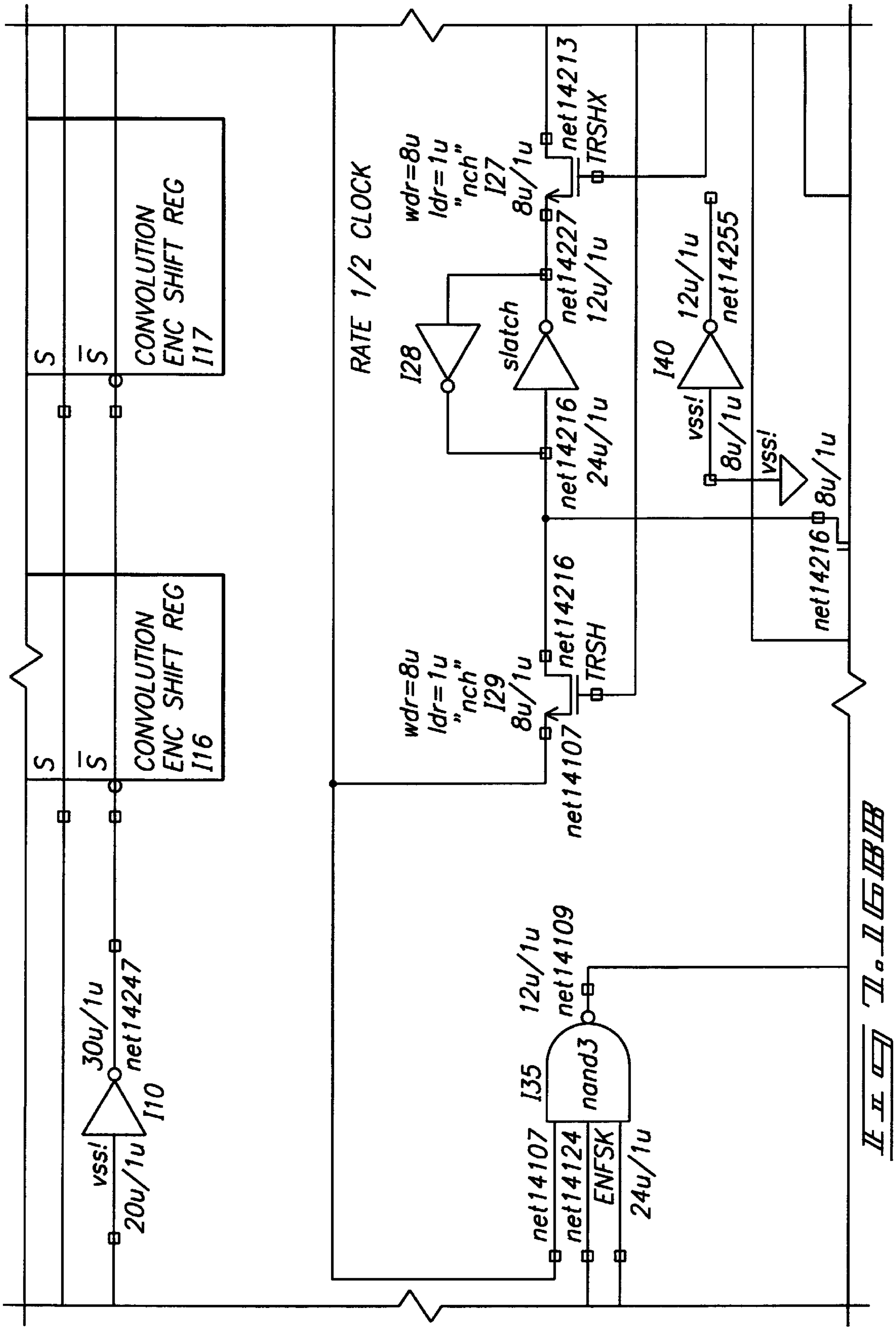
CONVOLUTION ENC SHIFT REG I17
CONVOLUTION ENC SHIFT REG I16
S
S̄
RATE 1/2 CLOCK
wdr=8u
ldr=1u
"nch"
I27
8u/1u
net14213
TRSHX
net14227
12u/1u
I28
slatch
net14216
24u/1u
I40
vss!
8u/1u
12u/1u
net14255
vss!
8u/1u
net14216
wdr=8u
ldr=1u
"nch"
I29
8u/1u
TRSH
net14107
30u/1u
net14247
I10
vss!
20u/1u
I35
nand3
12u/1u
net14109
net14107
net14124
ENFSK
24u/1u

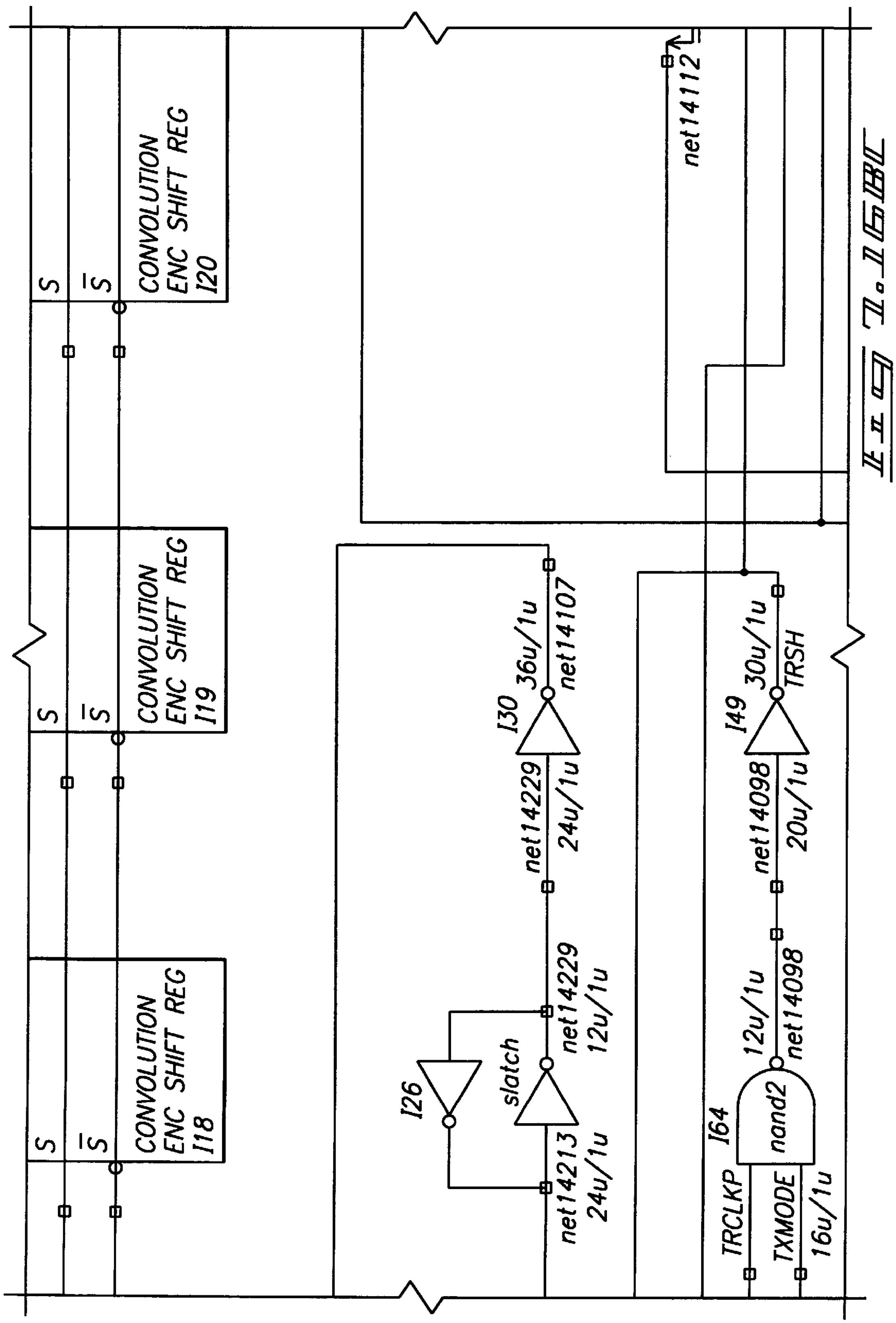
Fig. 7.16BC

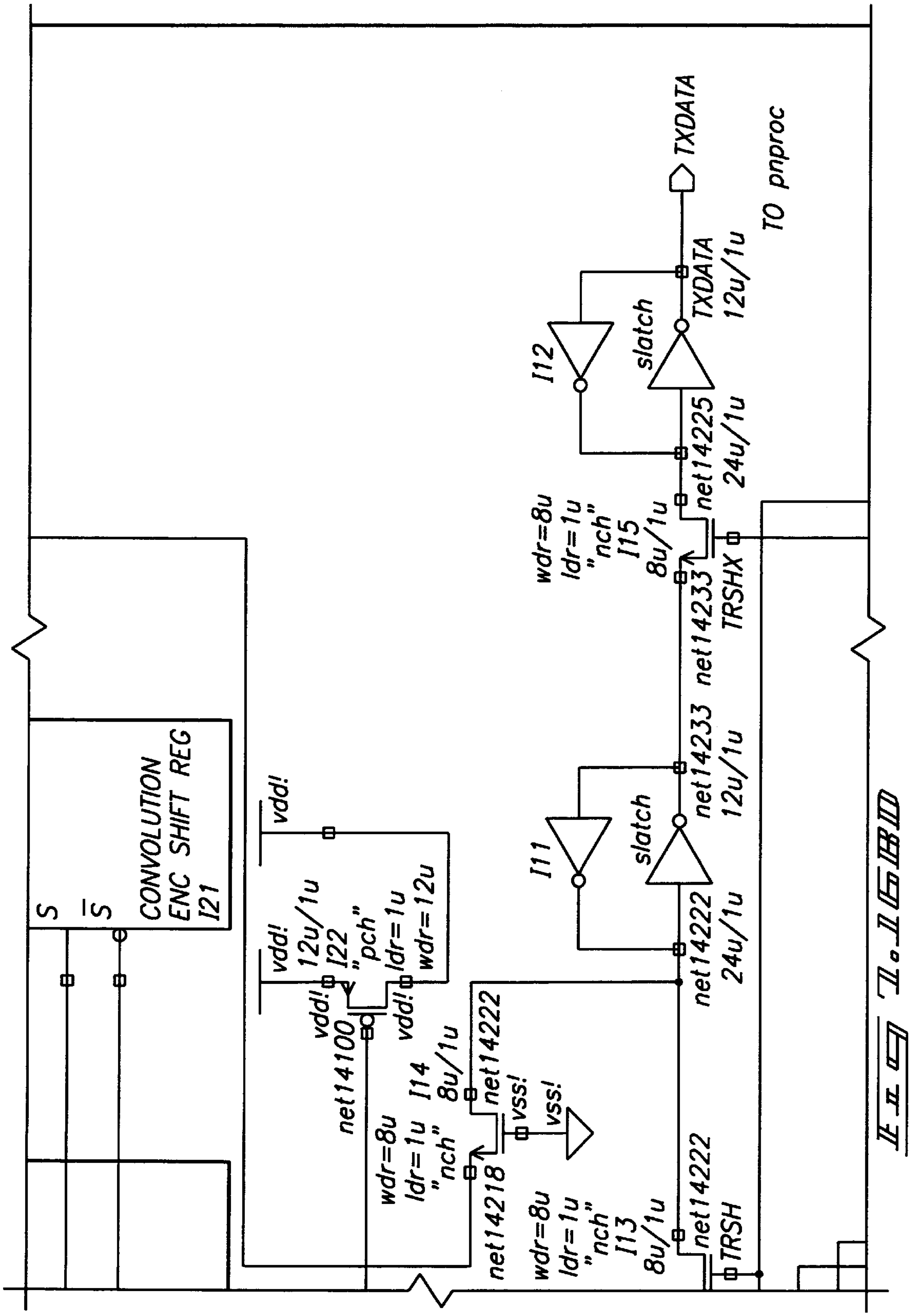
FIG. 7.16BD

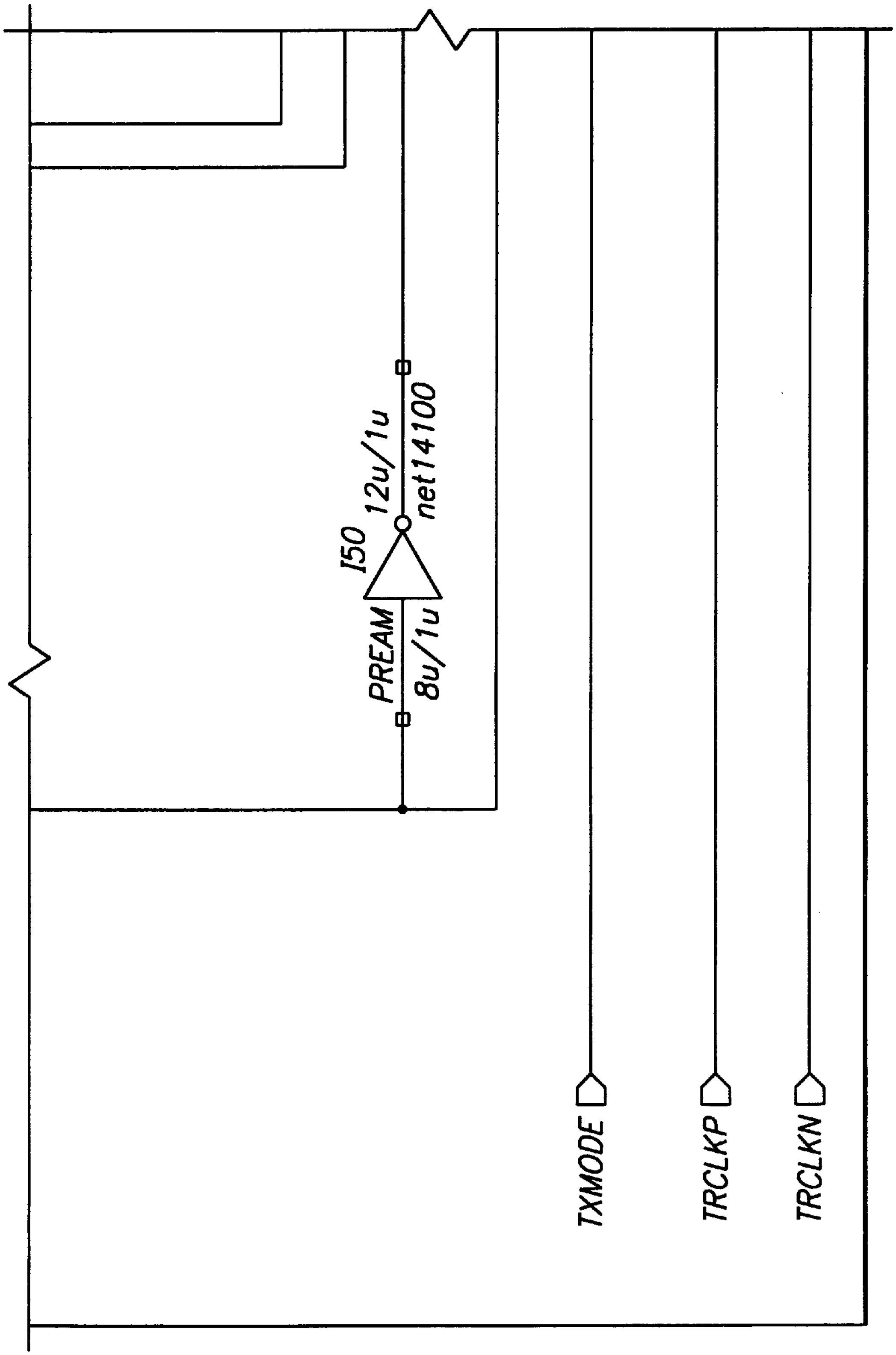
Fig. 7.16CA

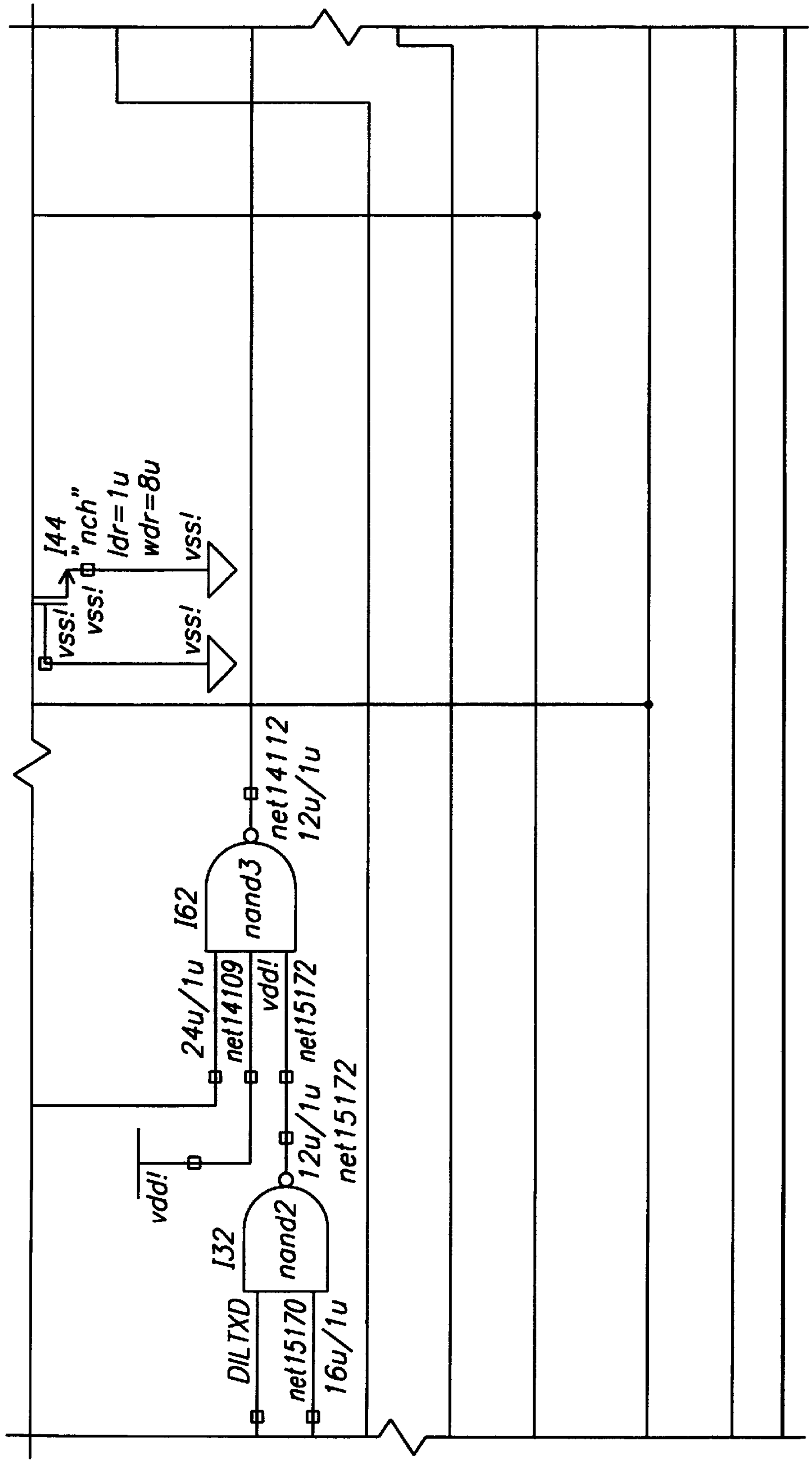
Fig. 7.16CB

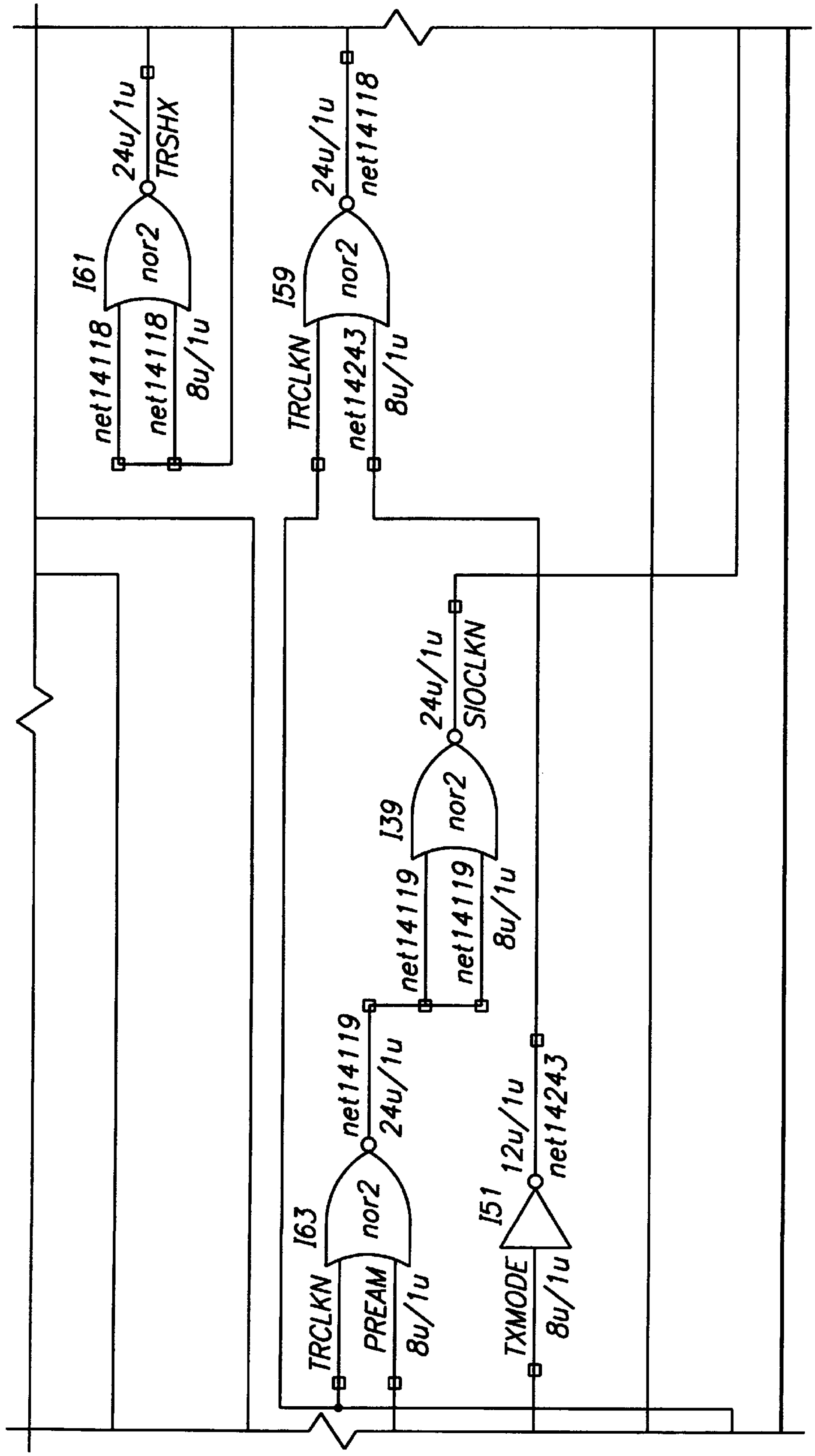
Fig 7.16CC

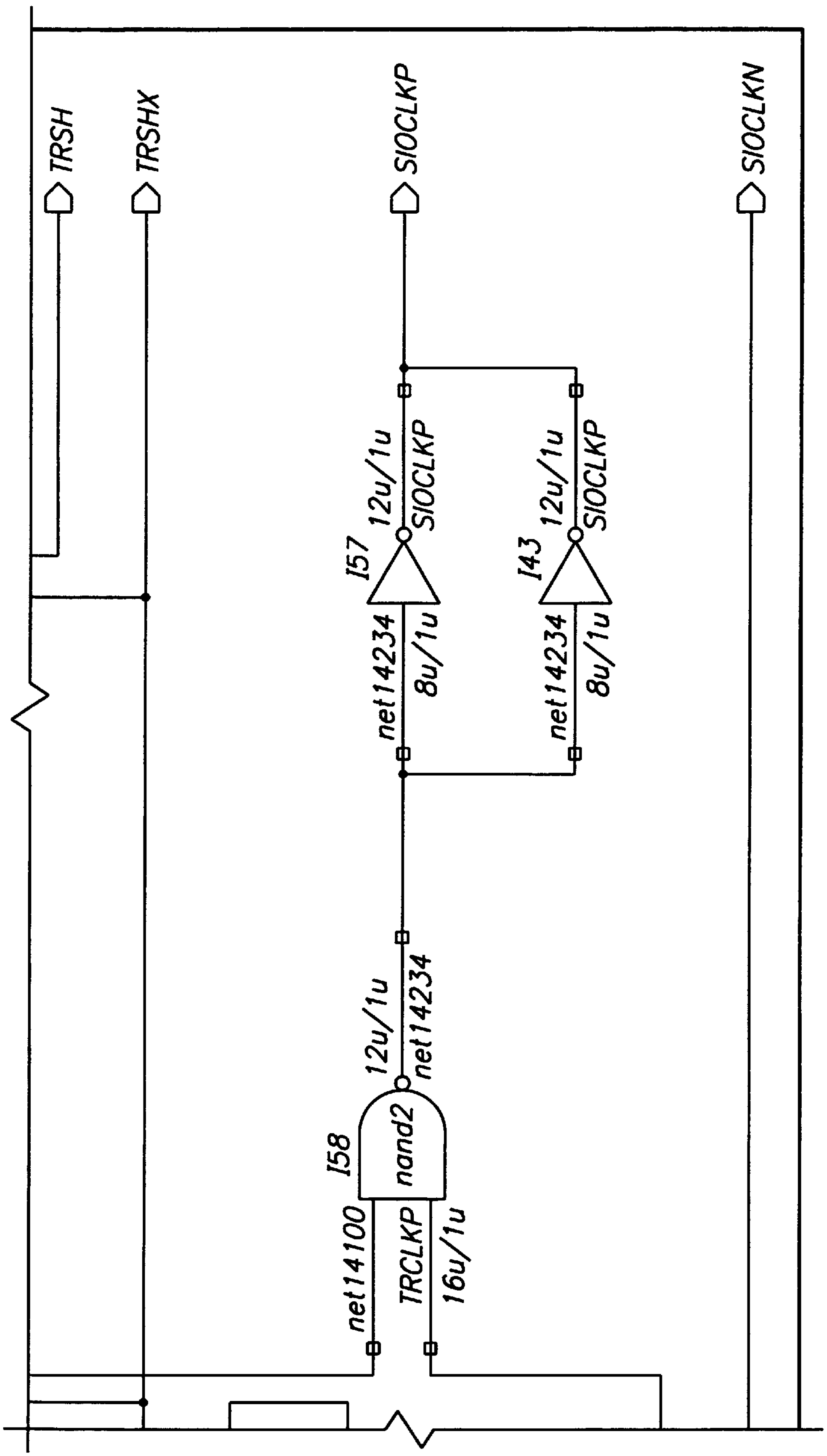
FIG. 7.16D

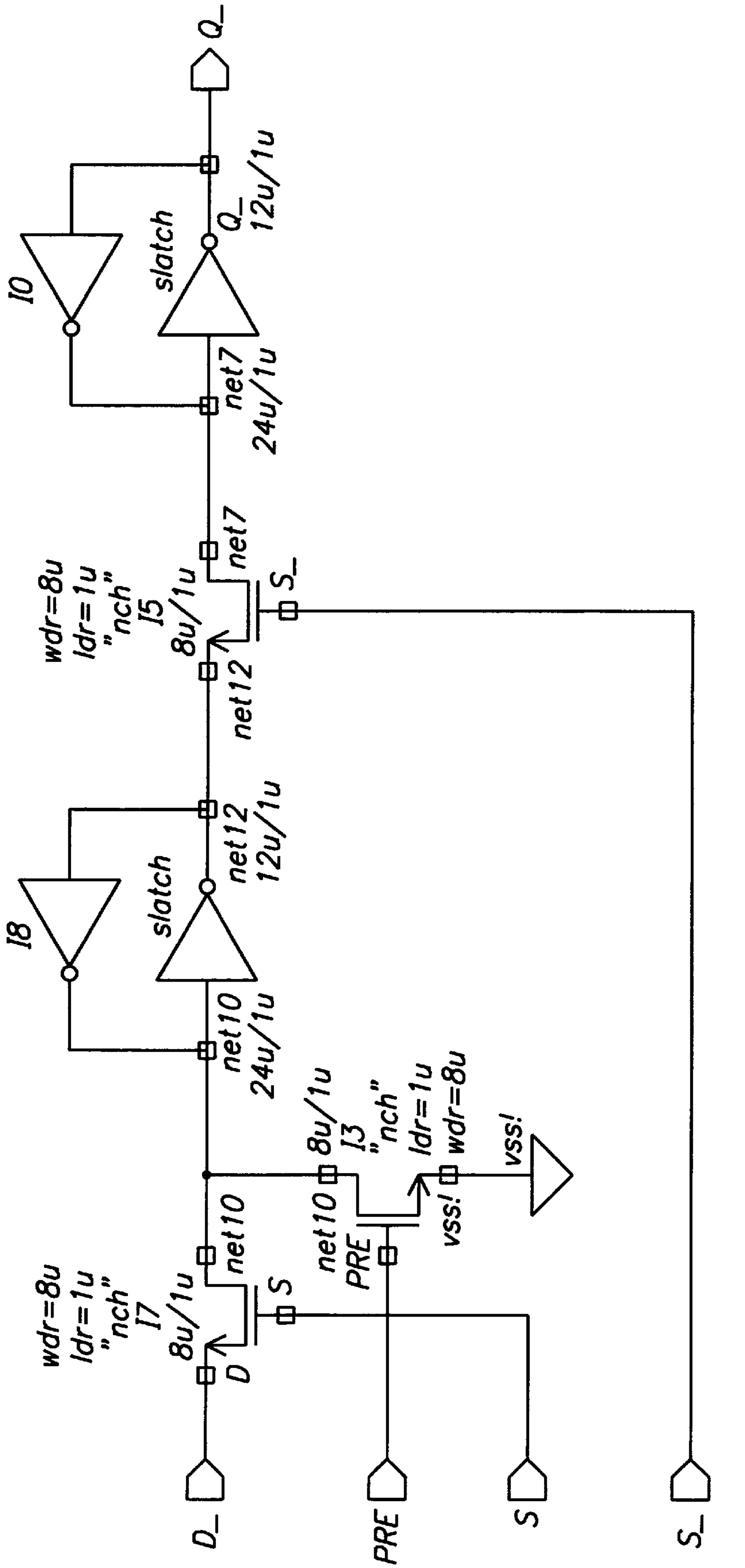
FIG. 1601

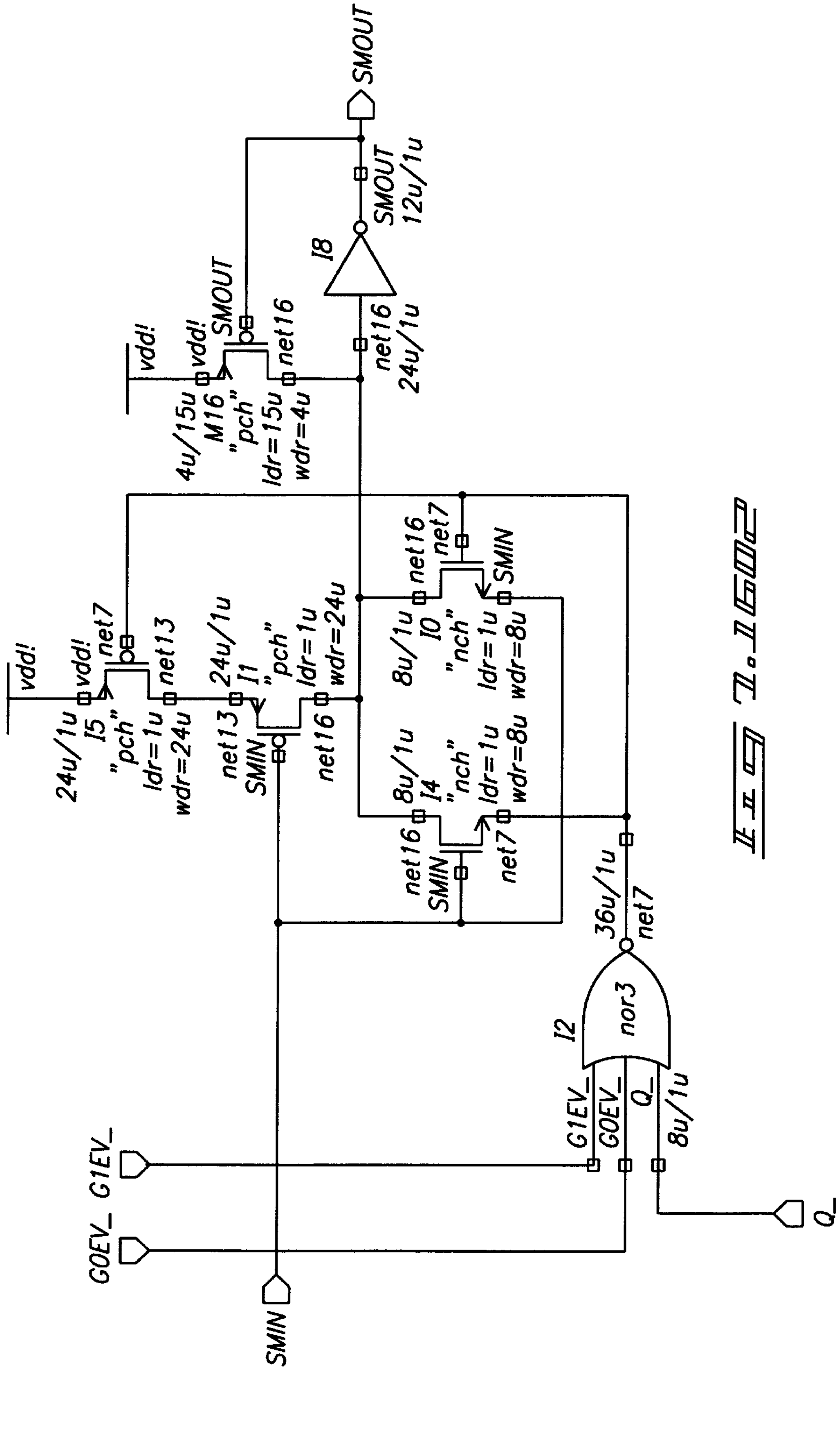
SMOUT
SMOUT
12u/1u
I8
net16
24u/1u
vdd!
vdd!
SMOUT
net16
4u/15u
M16
"pch"
ldr=15u
wdr=4u
vdd!
vdd!
net7
net13
24u/1u
I5
"pch"
ldr=1u
wdr=24u
24u/1u
I1
"pch"
ldr=1u
wdr=24u
net13
SMIN
net16
net16
net7
SMIN
8u/1u
I0
"nch"
ldr=1u
wdr=8u
8u/1u
I4
"nch"
ldr=1u
wdr=8u
net16
SMIN
net7
36u/1u
net7
I2
nor3
G1EV_
G0EV_
Q_
8u/1u
G0EV_
G1EV_
SMIN
Q_

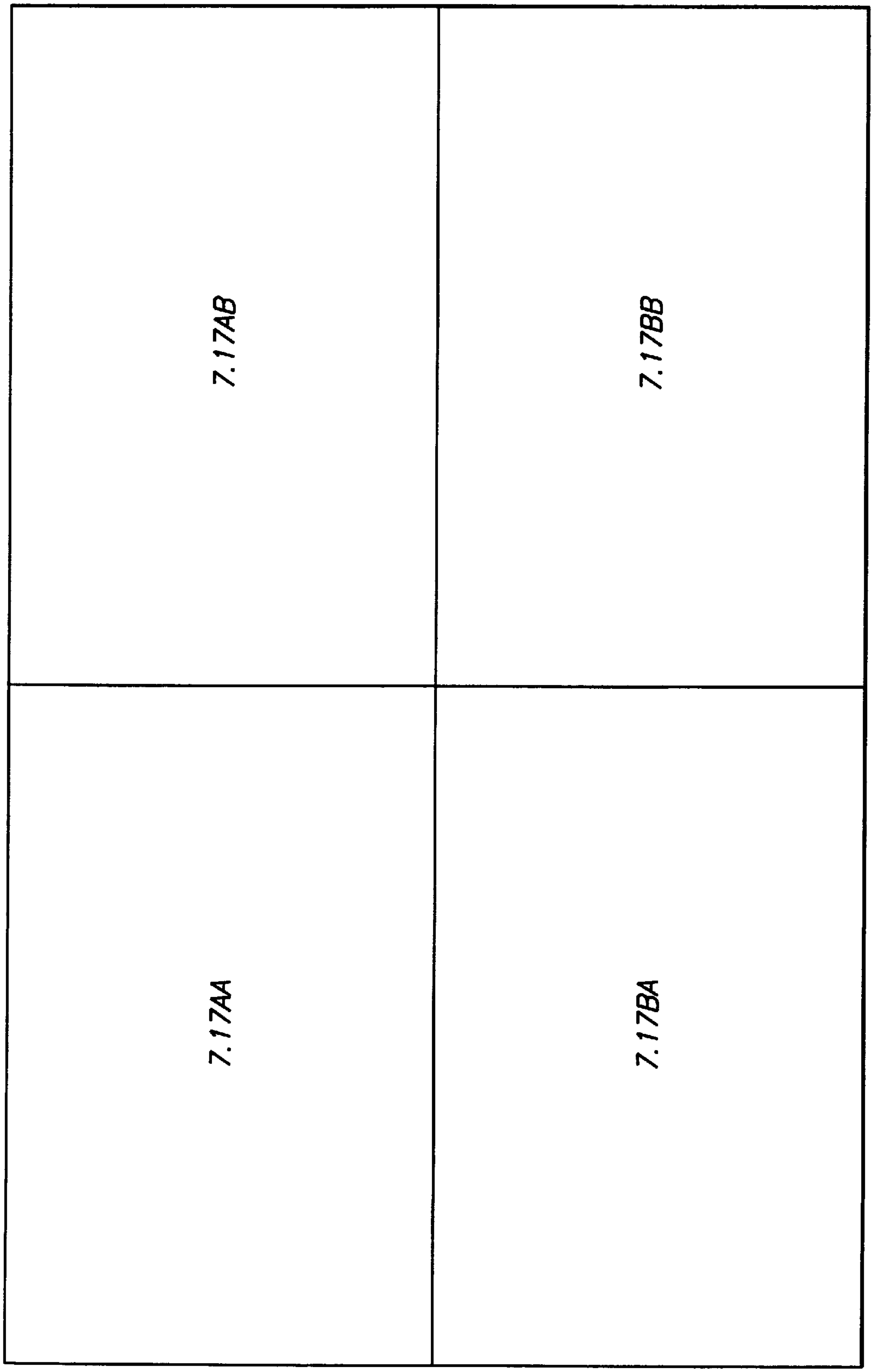
FIG. 7.17

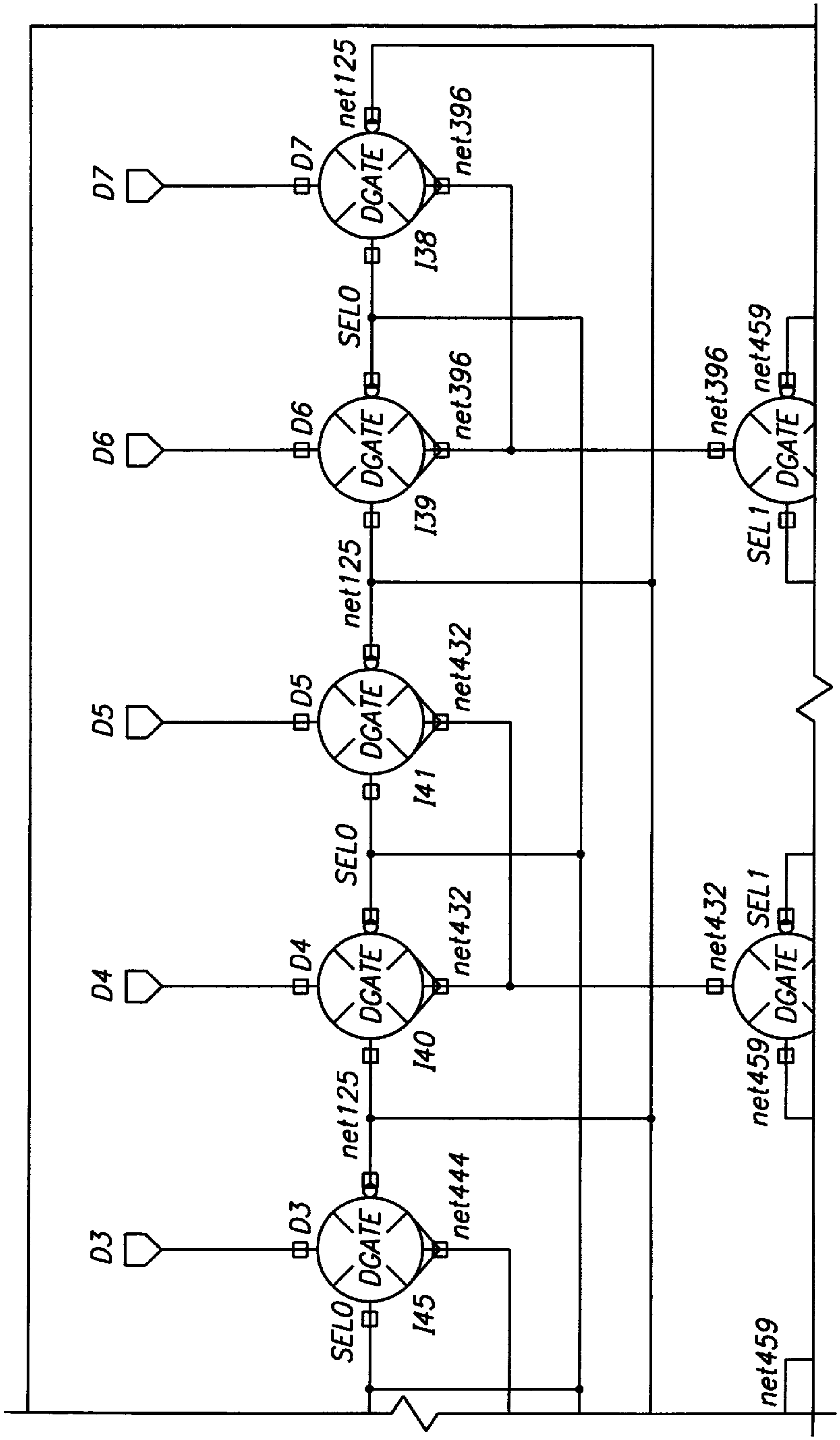
Fig. 7.11AB

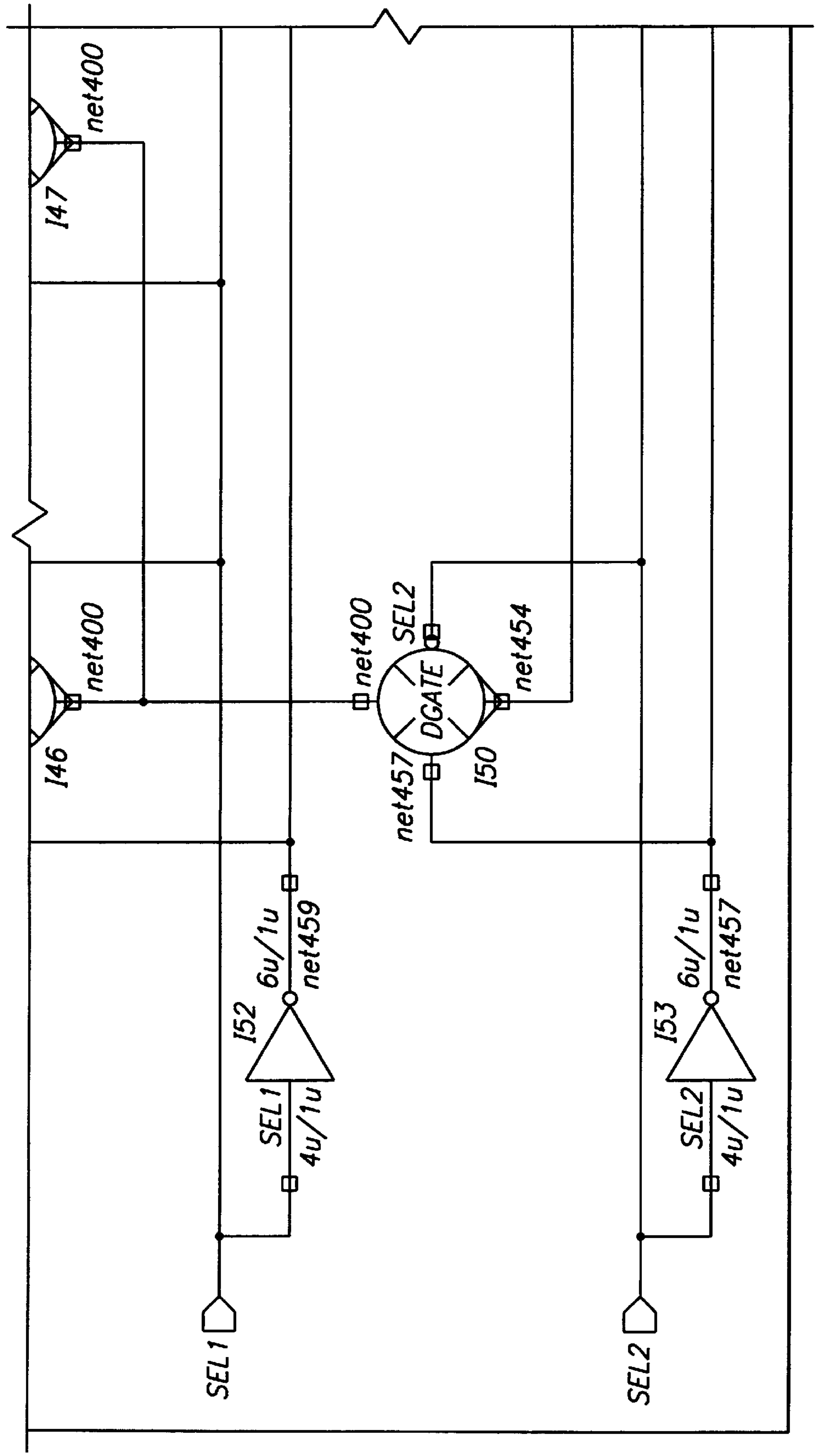
FIG. 1.1BA

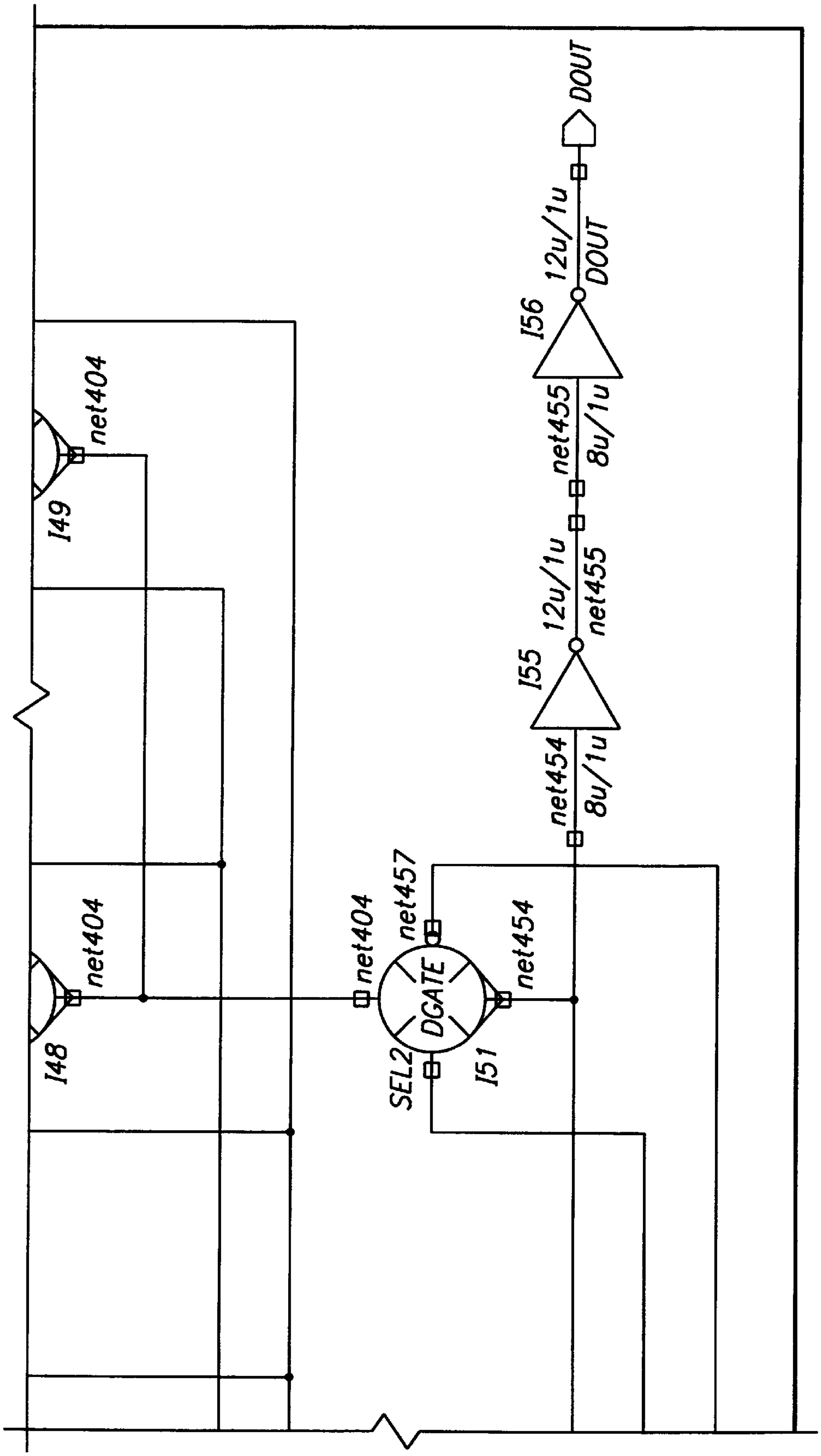
FIG. 7.11B

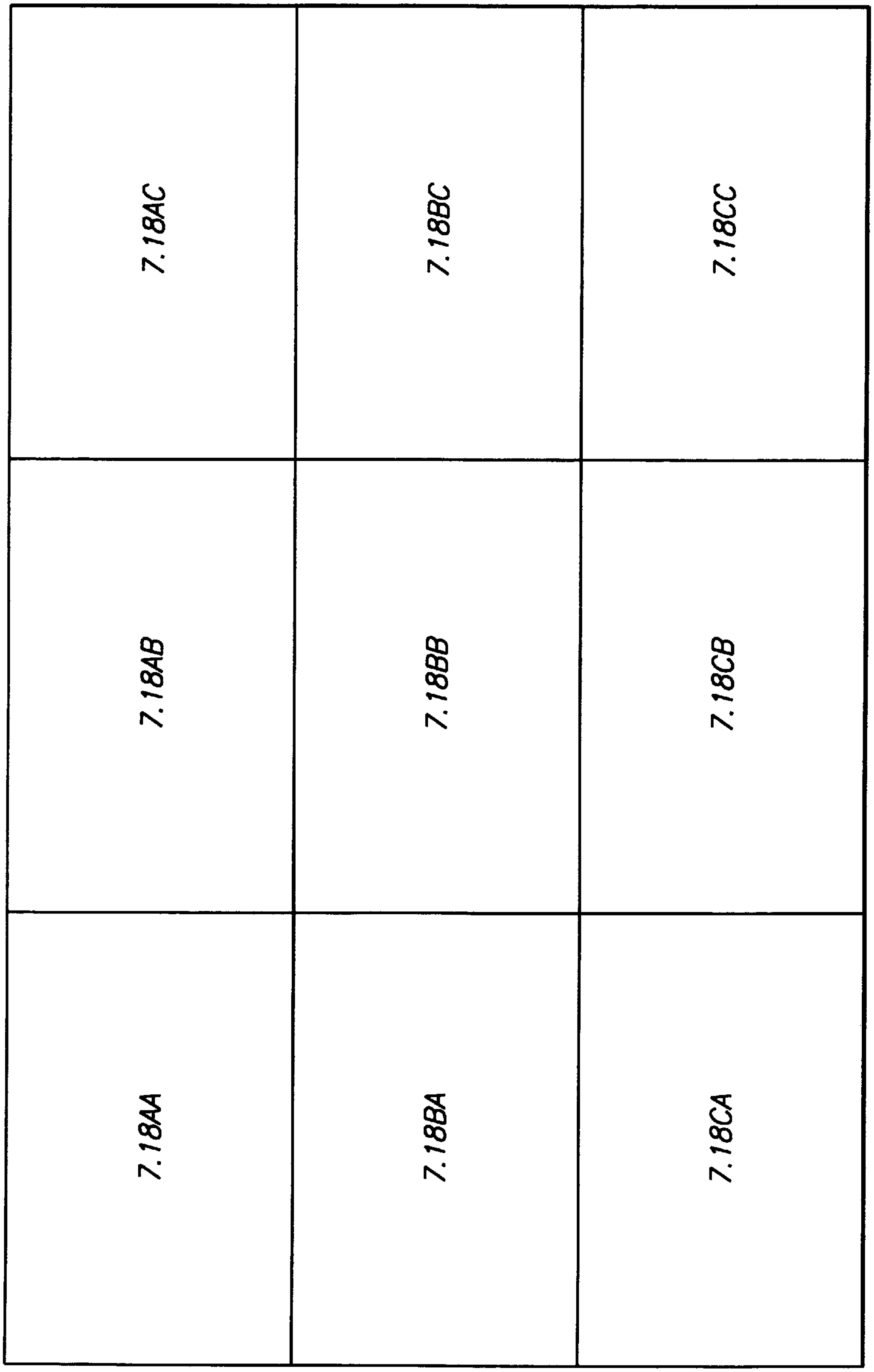
FIG. 7.18

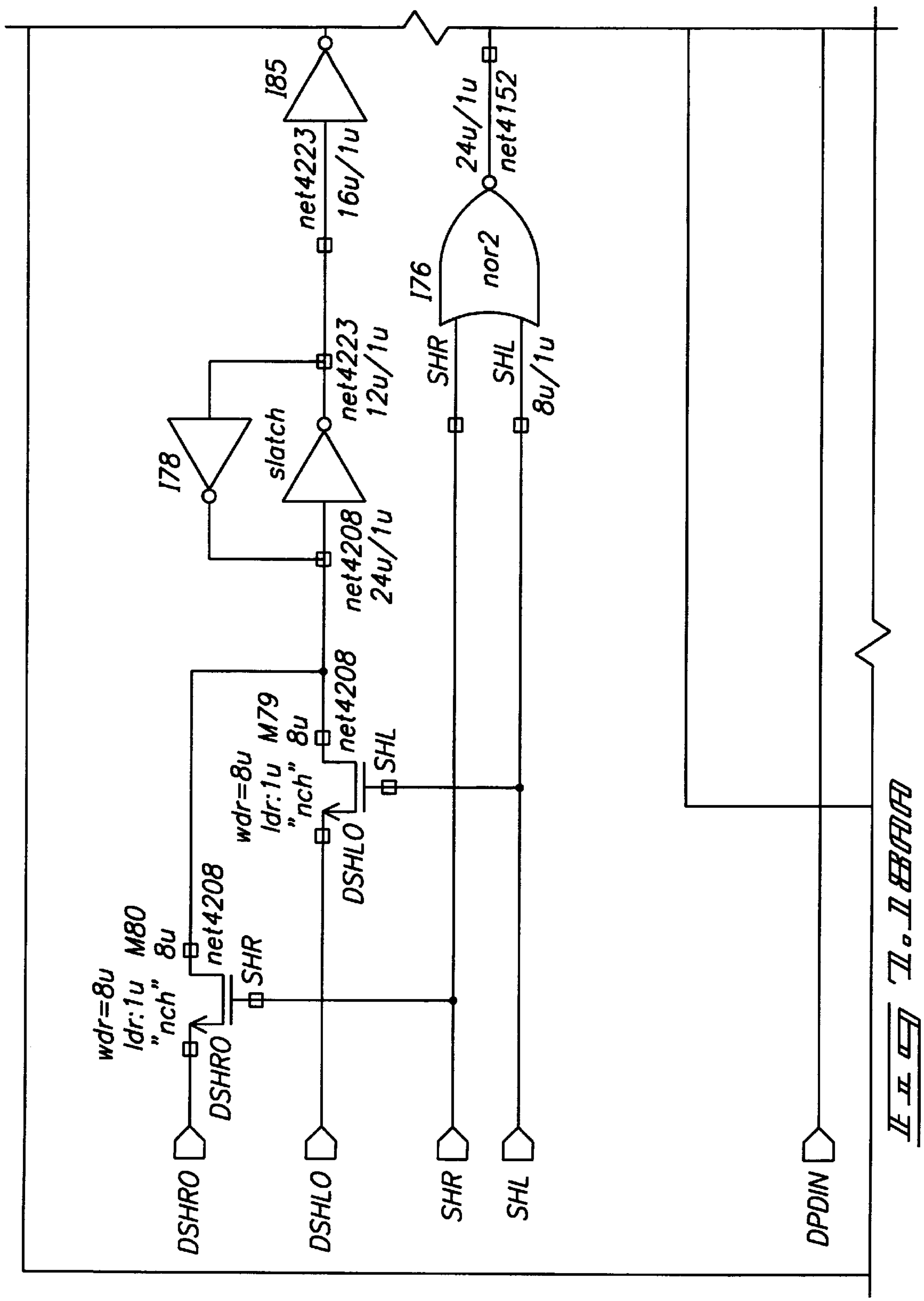
Fig. 7.18AAA

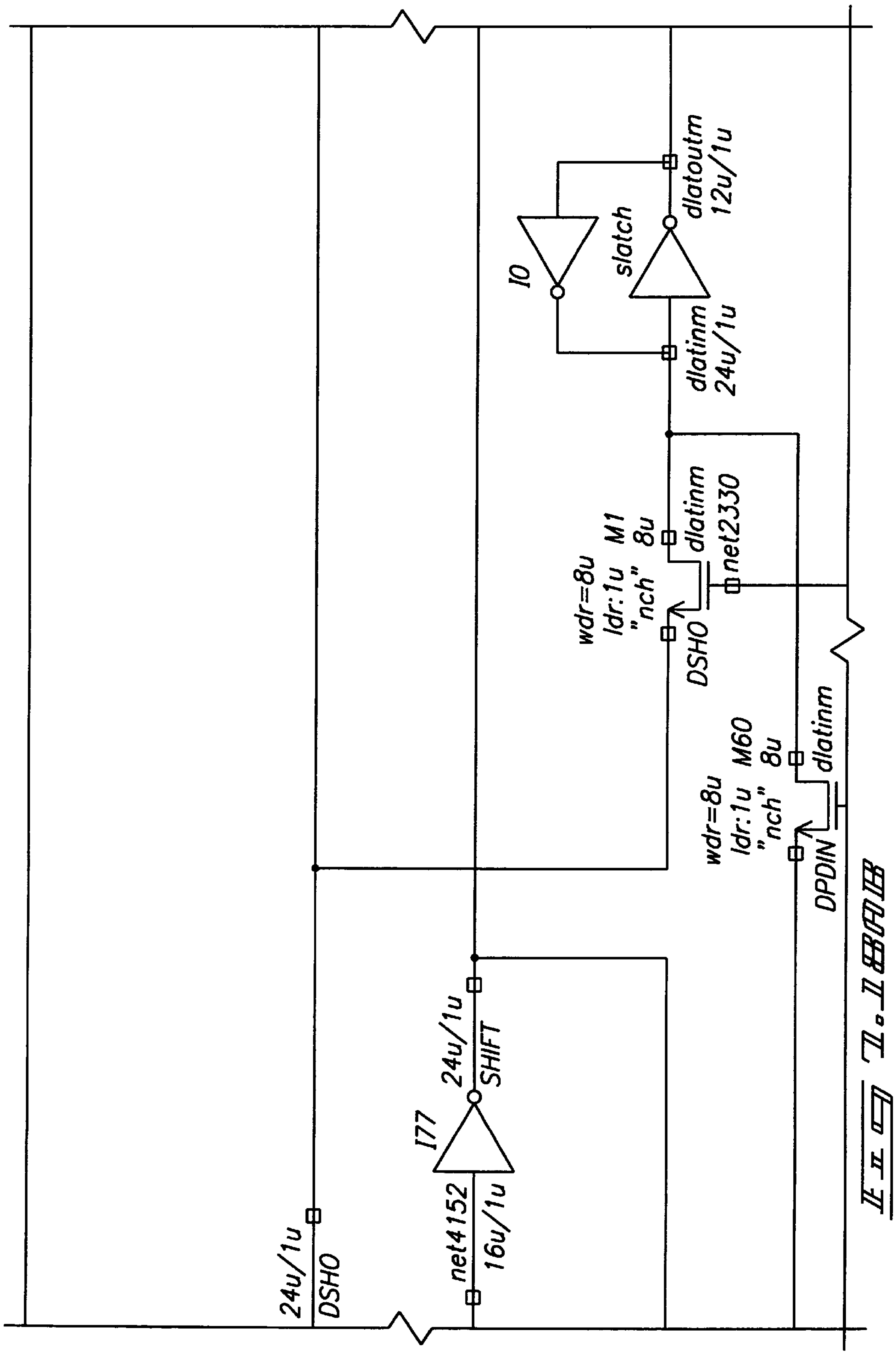
I0
slatch
dlatoutm
12u/1u
dlatinm
24u/1u
wdr=8u
ldr:1u
"nch"
M1
8u
dlatinm
net2330
DSHO
wdr=8u
ldr:1u
"nch"
M60
8u
dlatinm
DPDIN
I77
24u/1u
SHIFT
net4152
16u/1u
24u/1u
DSHO

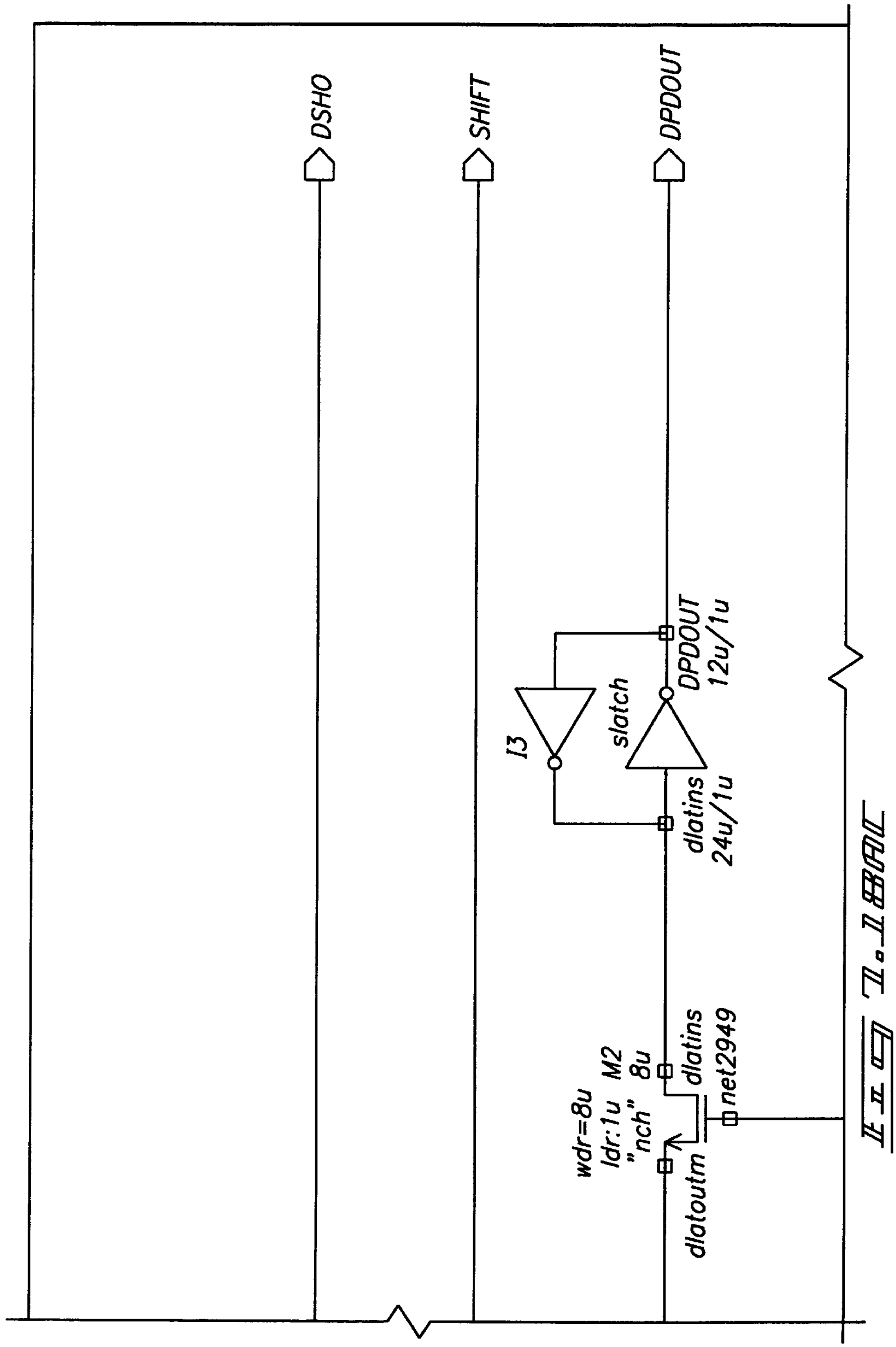
FIG. 7.18AC

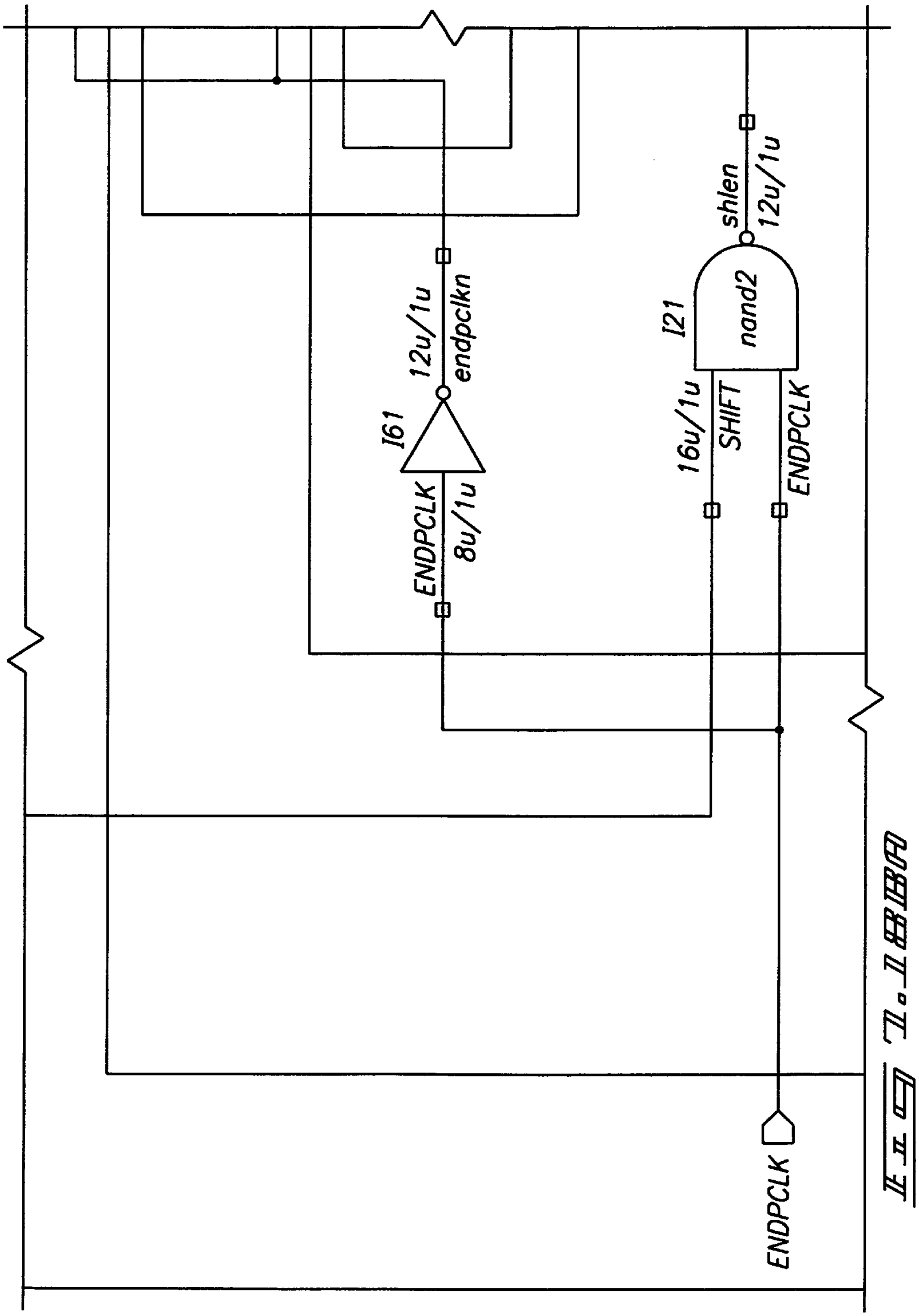
FIG. 7.118A

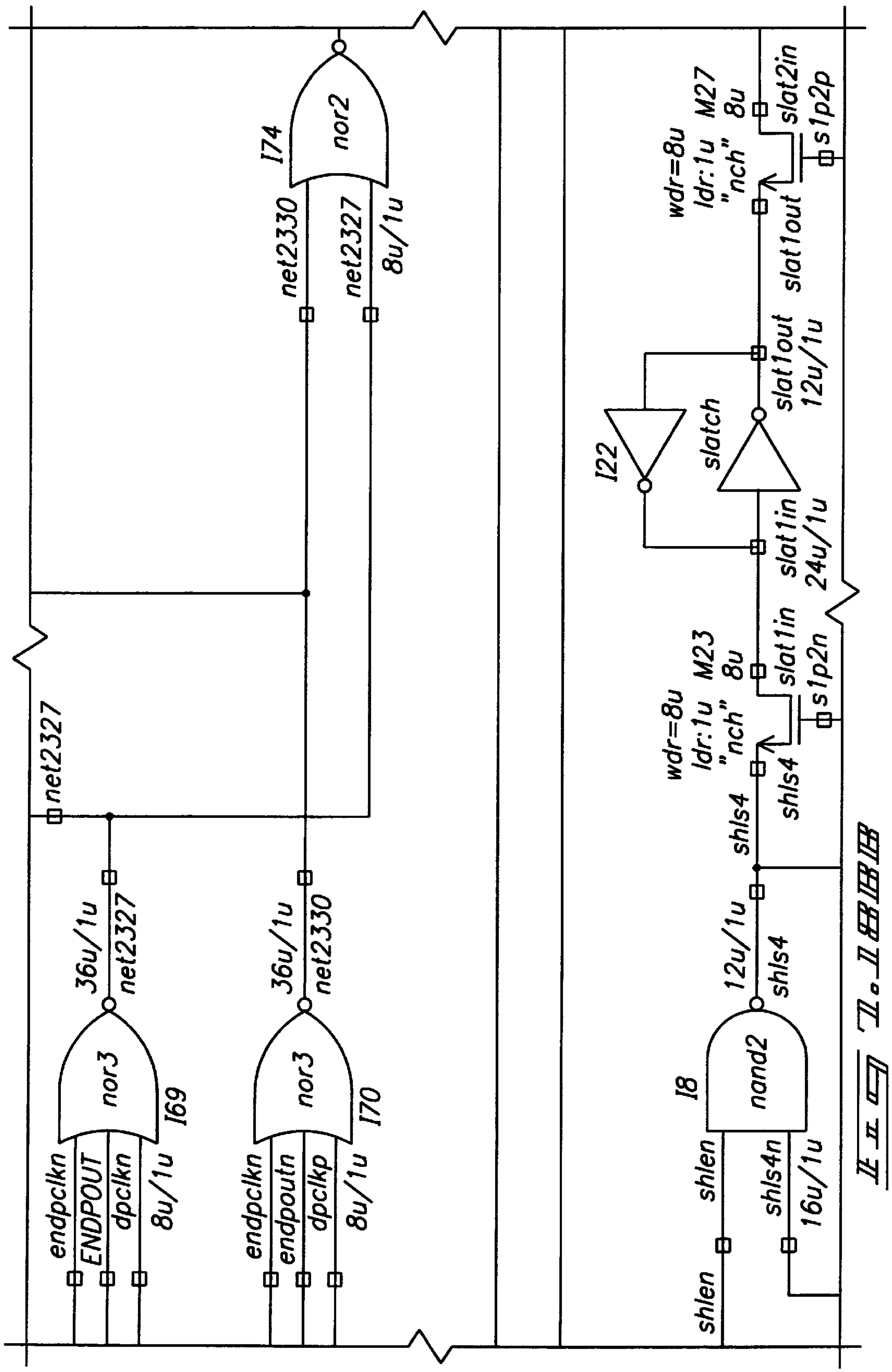
nor2
I74
net2330
net2327
8u/1u
net2327
nor3
I69
36u/1u
net2327
endpclkn
ENDPOUT
dpclkn
8u/1u
nor3
I70
36u/1u
net2330
endpclkn
endpoutn
dpclkp
8u/1u
wdr=8u
ldr:1u
"nch"
M27
8u
slat2in
s1p2p
slat1out
slat1out
12u/1u
slatch
I22
slat1in
24u/1u
wdr=8u
ldr:1u
"nch"
M23
8u
slat1in
s1p2n
shls4
shls4
12u/1u
shls4
nand2
I8
shlen
shls4n
16u/1u
shlen

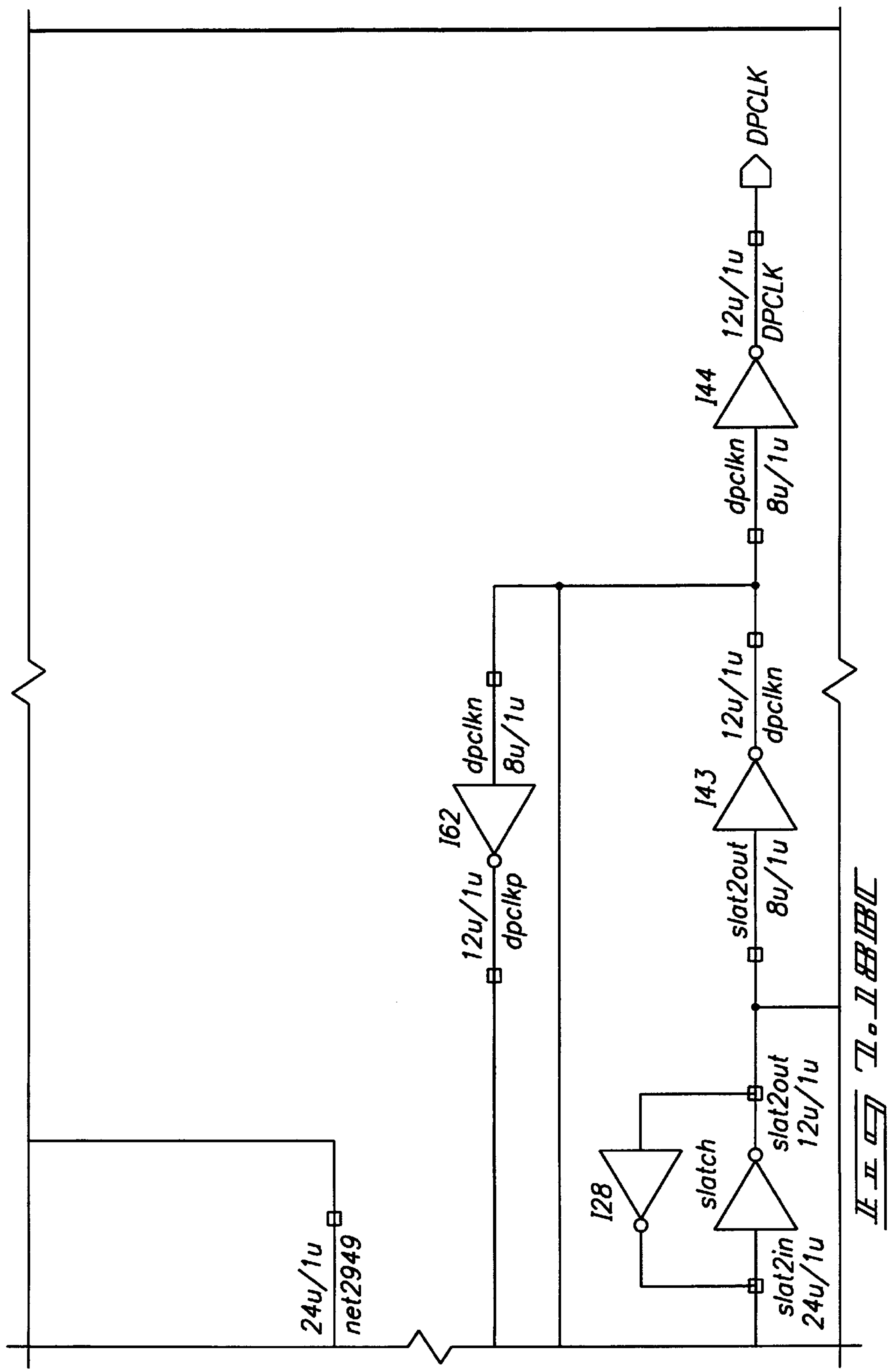
DPCLK
12u/1u
DPCLK
I44
dpclkn
8u/1u
dpclkn
8u/1u
I62
12u/1u
dpclkp
12u/1u
dpclkn
I43
slat2out
8u/1u
I28
slatch
slat2out
12u/1u
slat2in
24u/1u
24u/1u
net2949

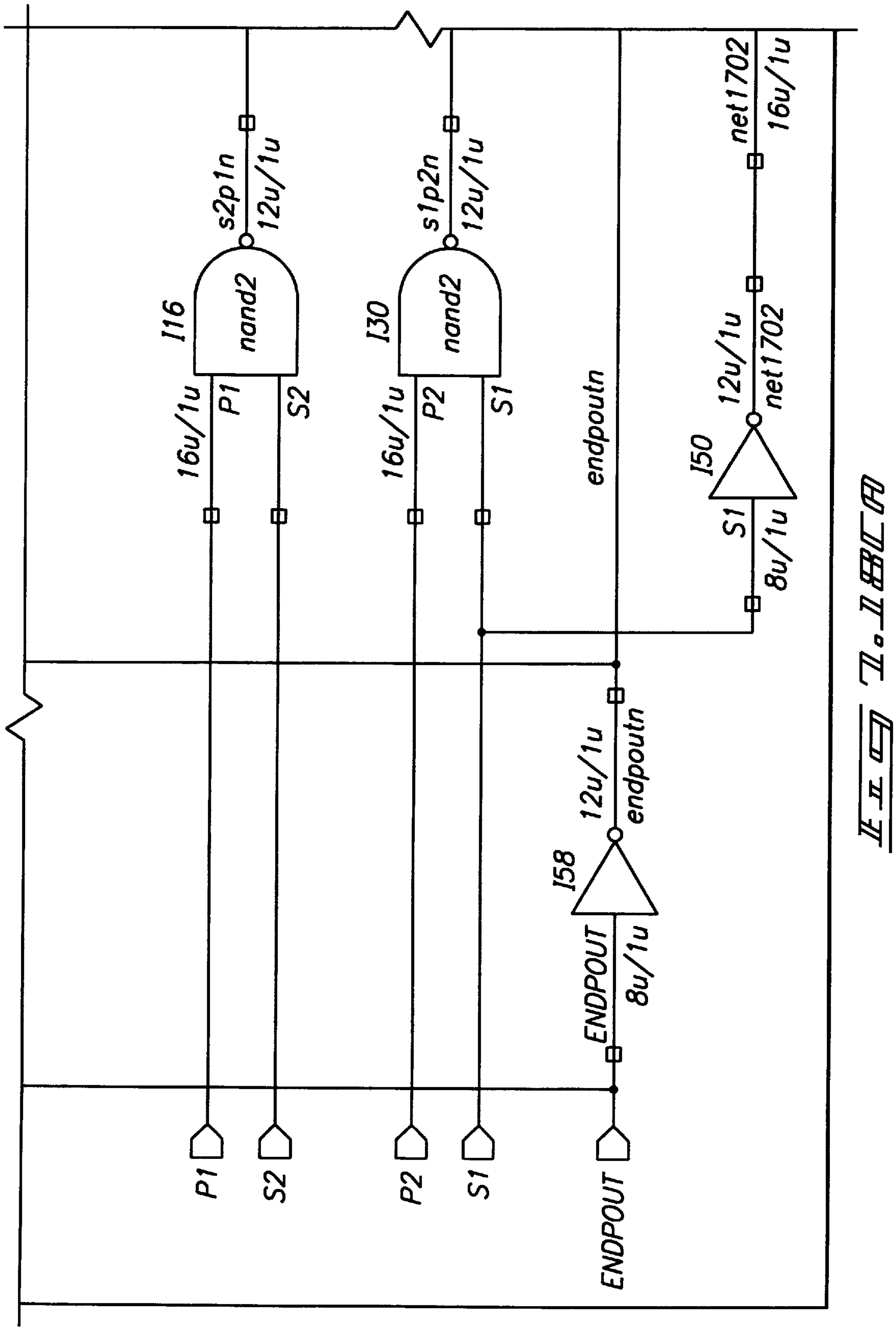
FIG. 7.118CA

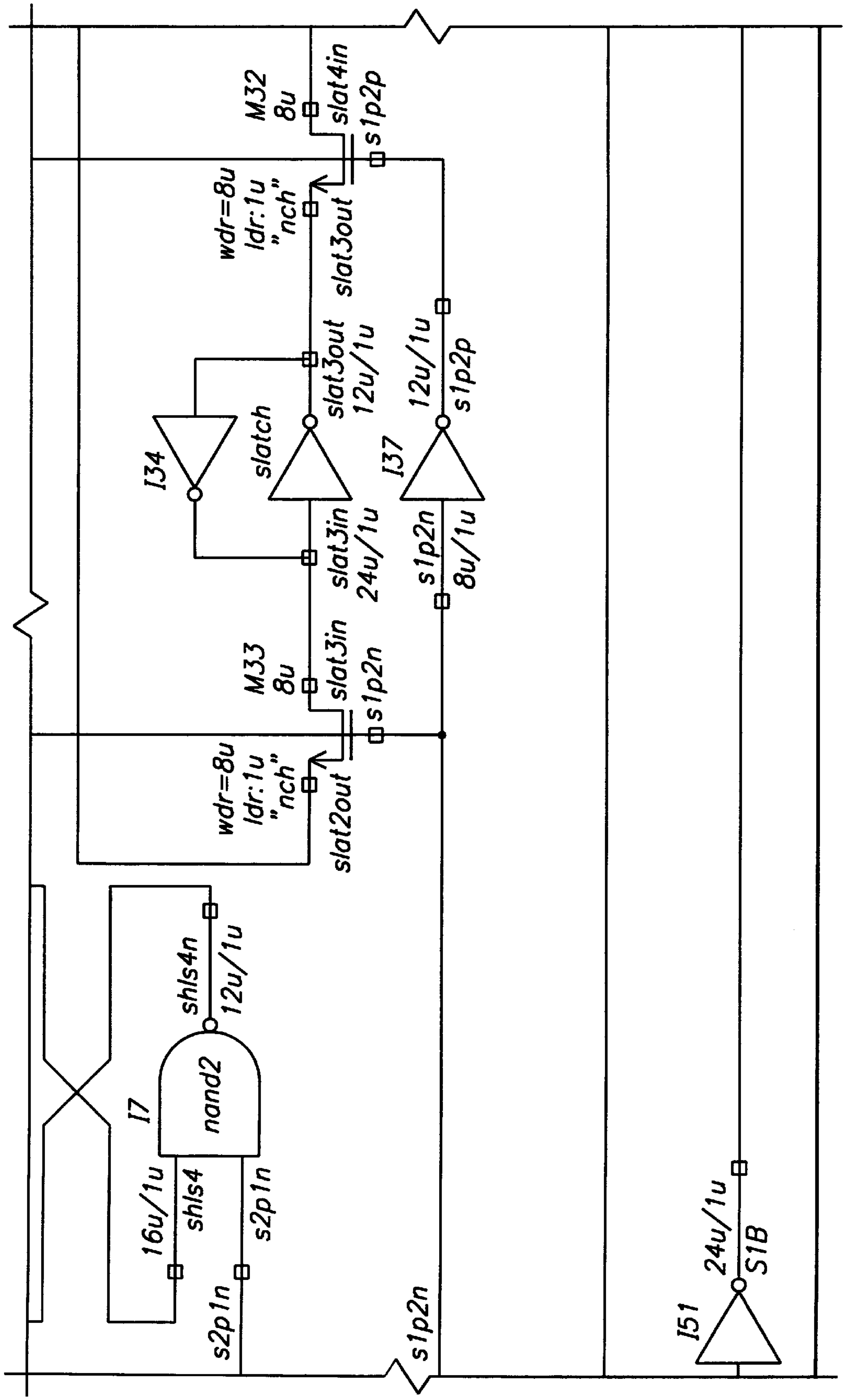
M32
8u
slat4in
s1p2p
wdr=8u
ldr:1u
"nch"
slat3out
slat3out
12u/1u
12u/1u
s1p2p
I34
slatch
I37
slat3in
24u/1u
s1p2n
8u/1u
M33
8u
slat3in
s1p2n
wdr=8u
ldr:1u
"nch"
slat2out
shls4n
12u/1u
I7
nand2
16u/1u
shls4
s2p1n
s2p1n
s1p2n
I51
24u/1u
S1B

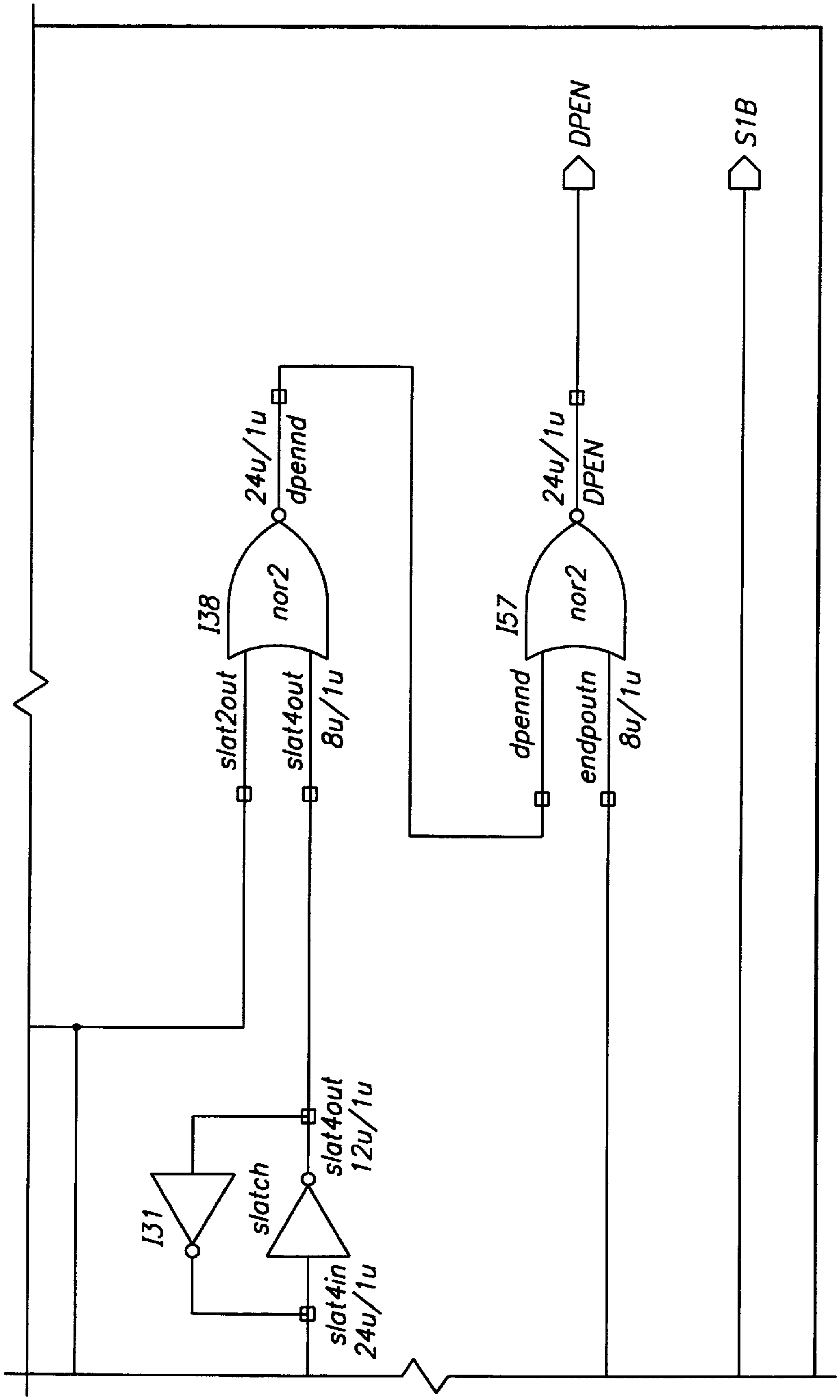
FIG. 7.18CC

| | | | | |
|---|---|---|---|---|
| 8.01AA | 8.01AB | 8.01AC | 8.01AD | 8.01AE |
| 8.01BA | 8.01BB | 8.01BC | 8.01BD | 8.01BE |
| 8.01CA | 8.01CB | 8.01CC | 8.01CD | 8.01CE |
| 8.01DA | 8.01DB | 8.01DC | 8.01DD | 8.01DE |

Fig. 8.01

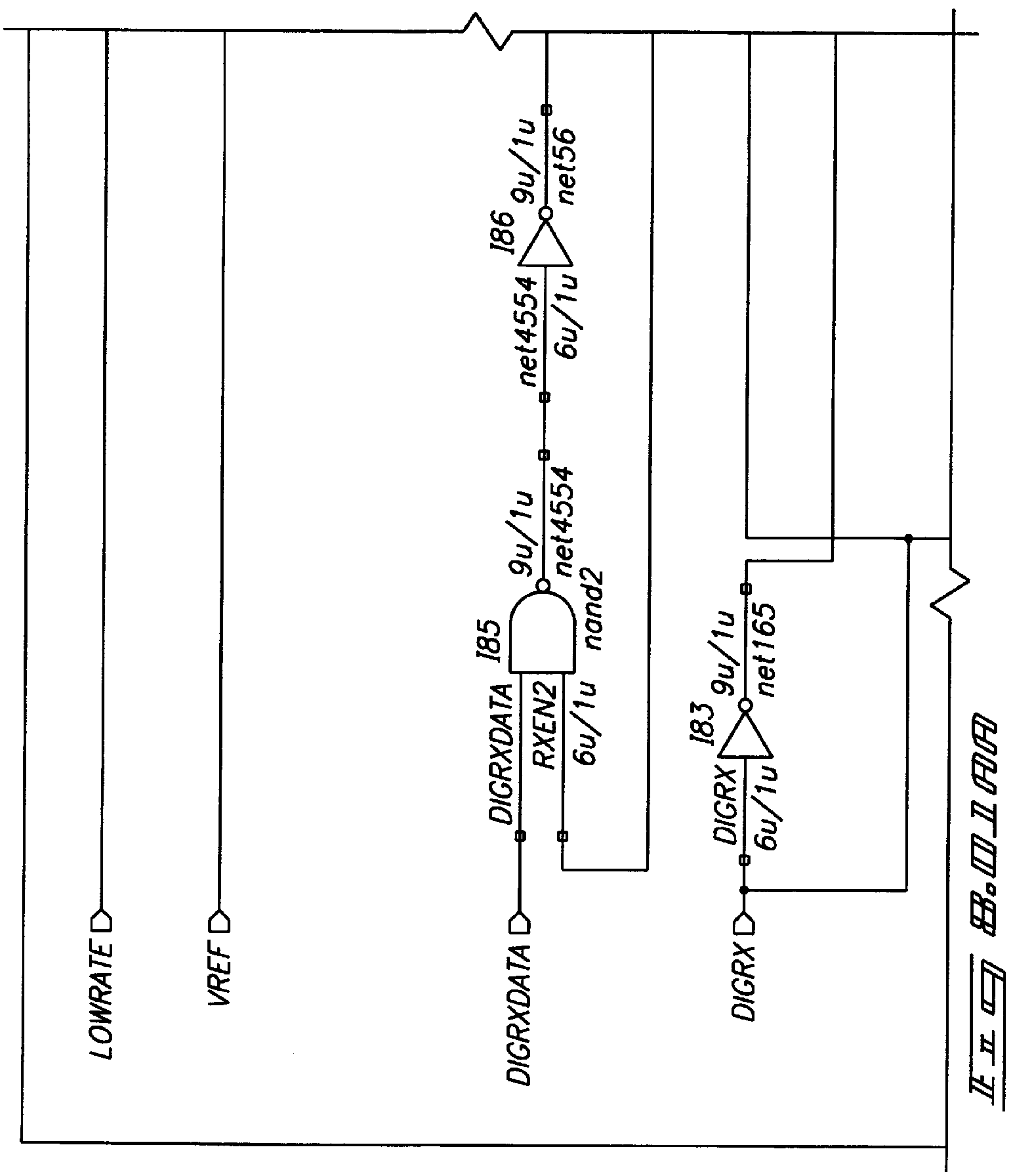
FIG. 8.01IAA

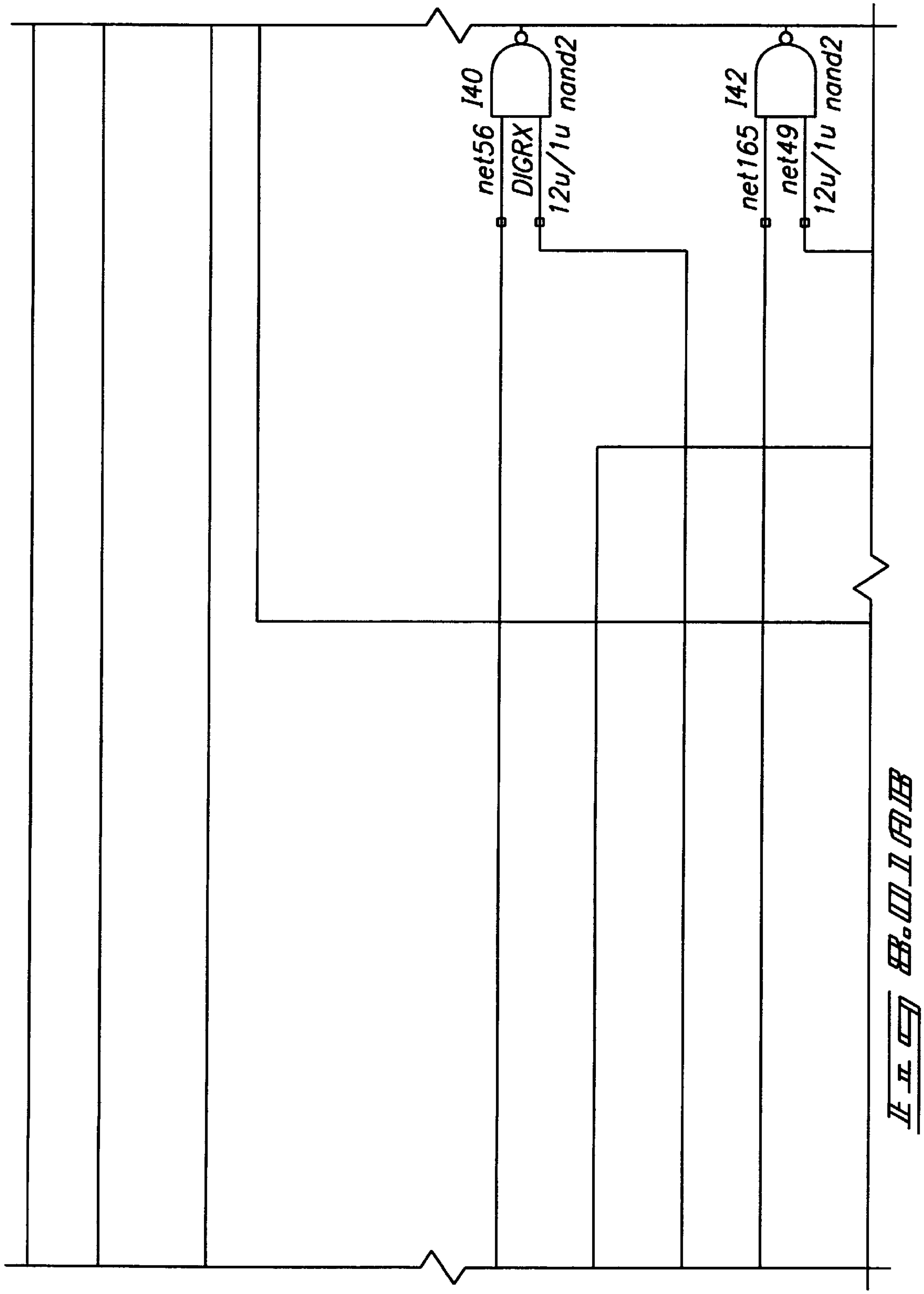
Fig. 8.01AB

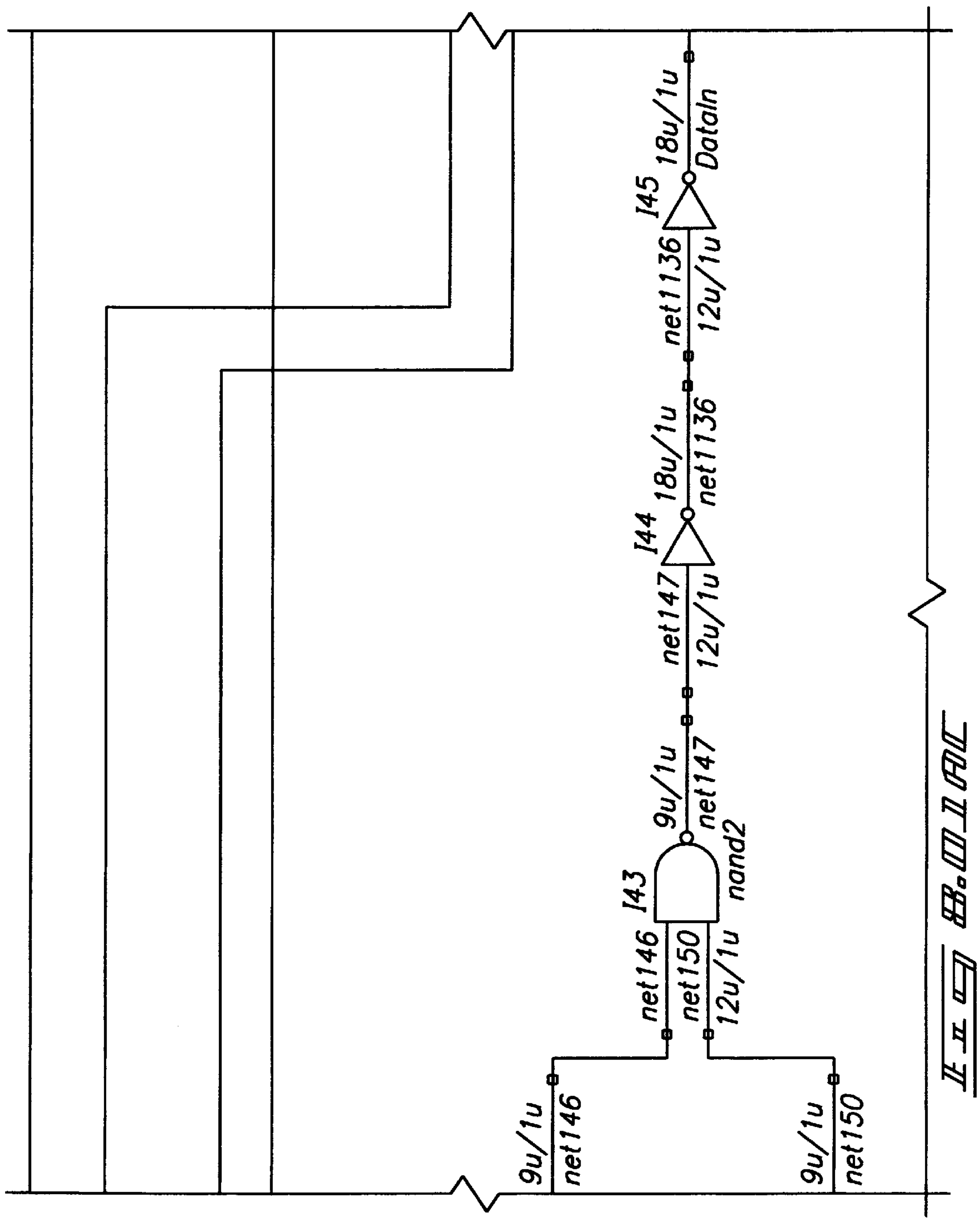
Fig. 8.01AC

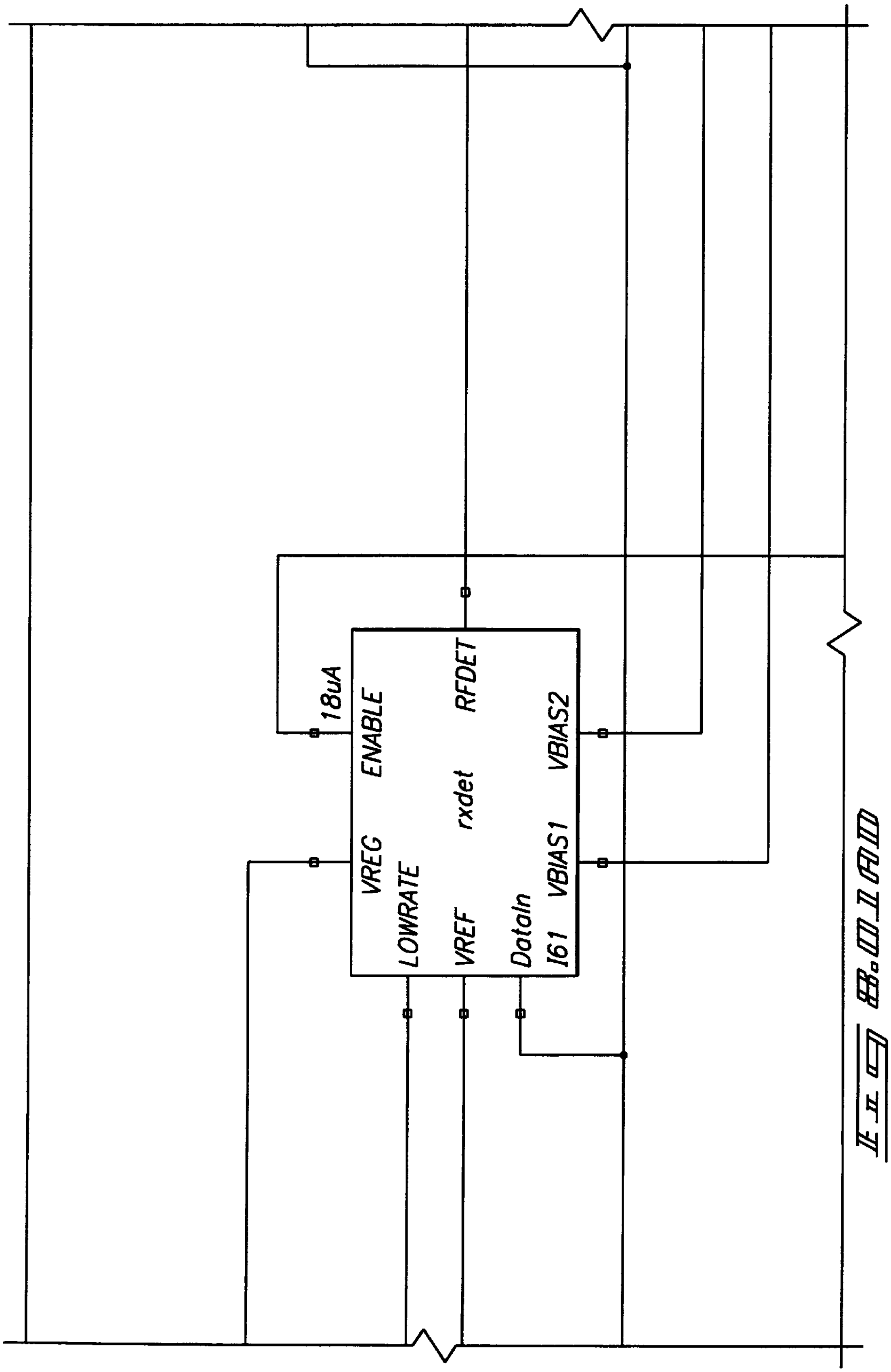
Fig. 8.01AD

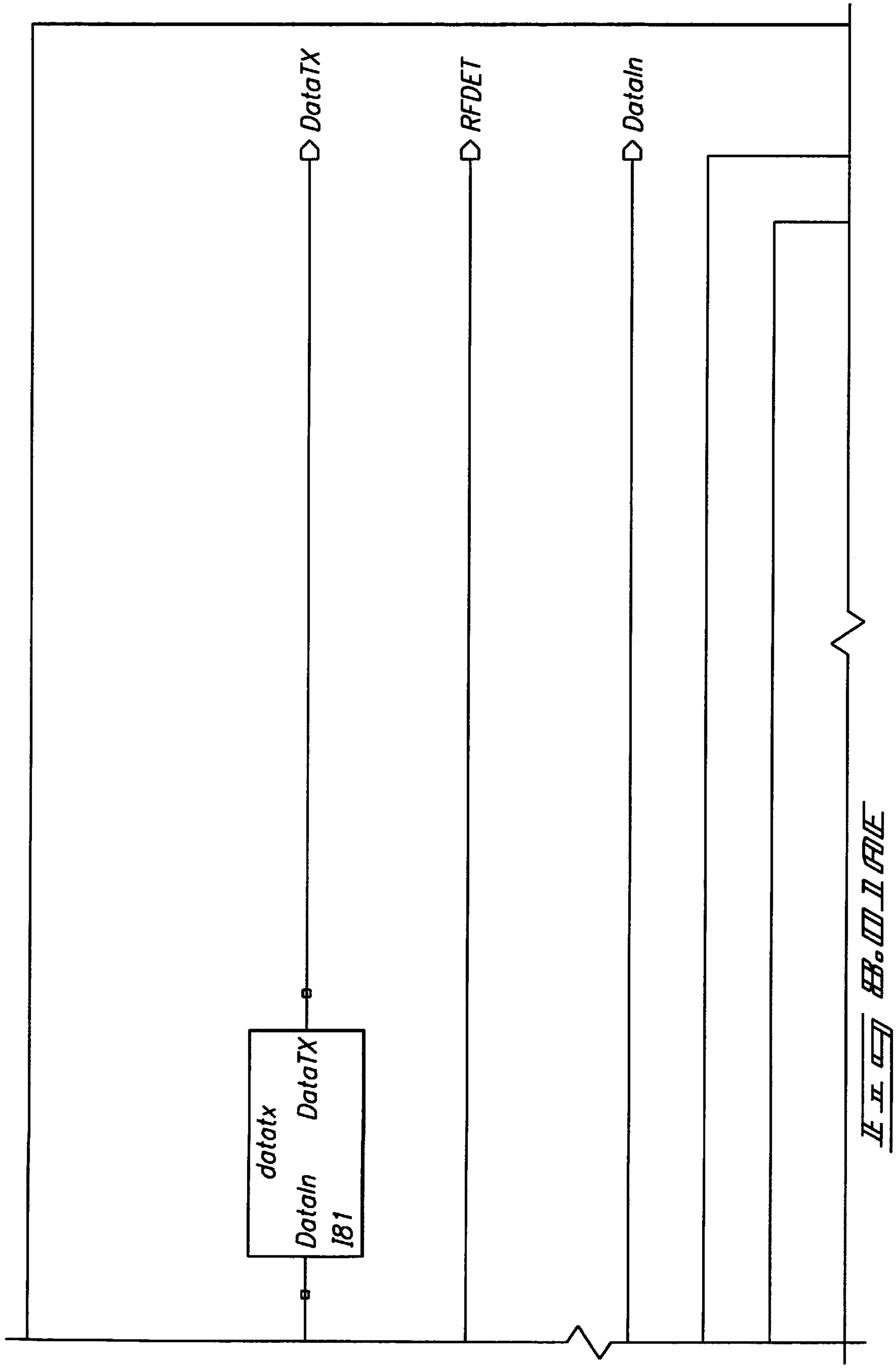
FIG. 8.01AE

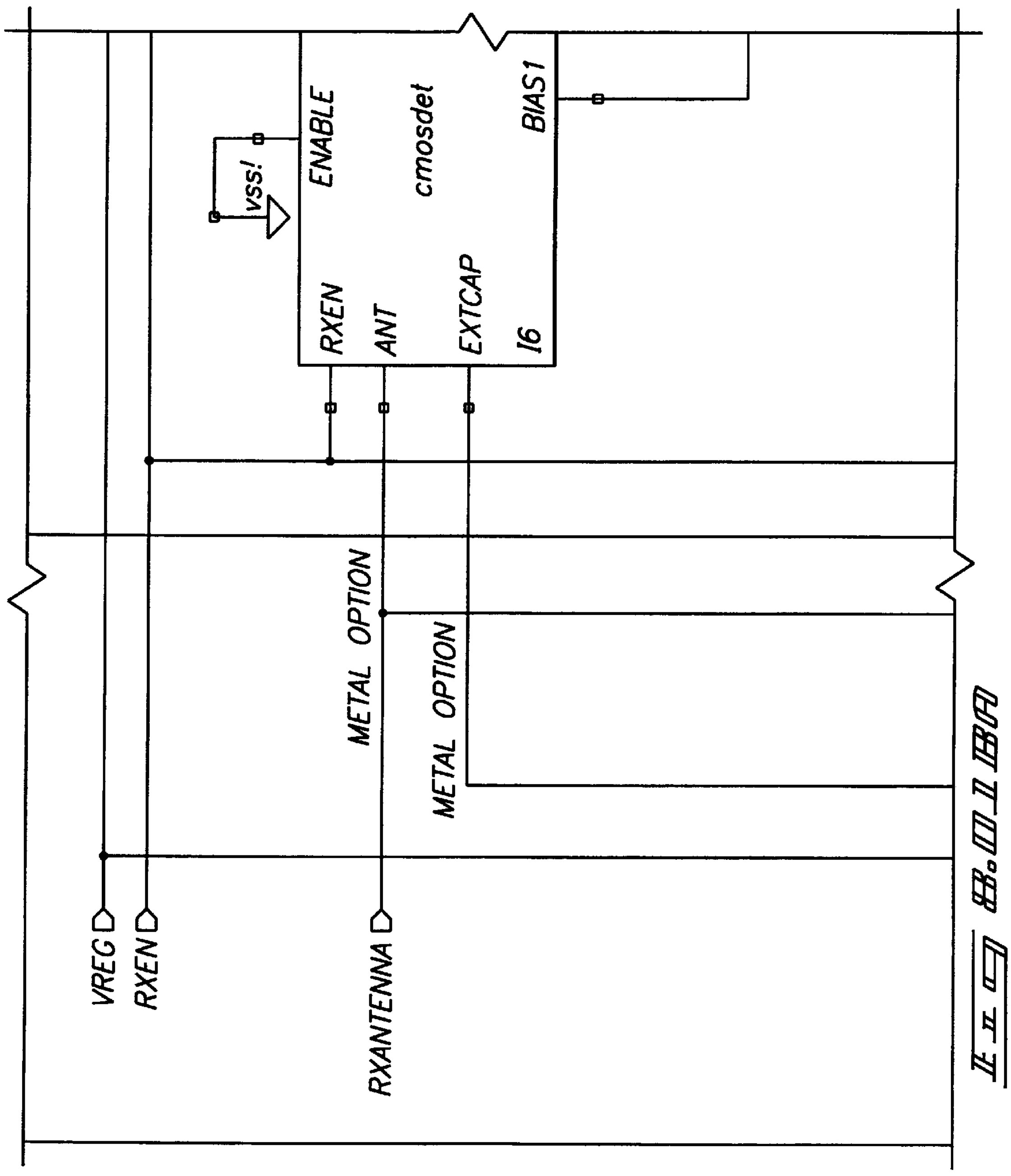
FIG. 8.01BA

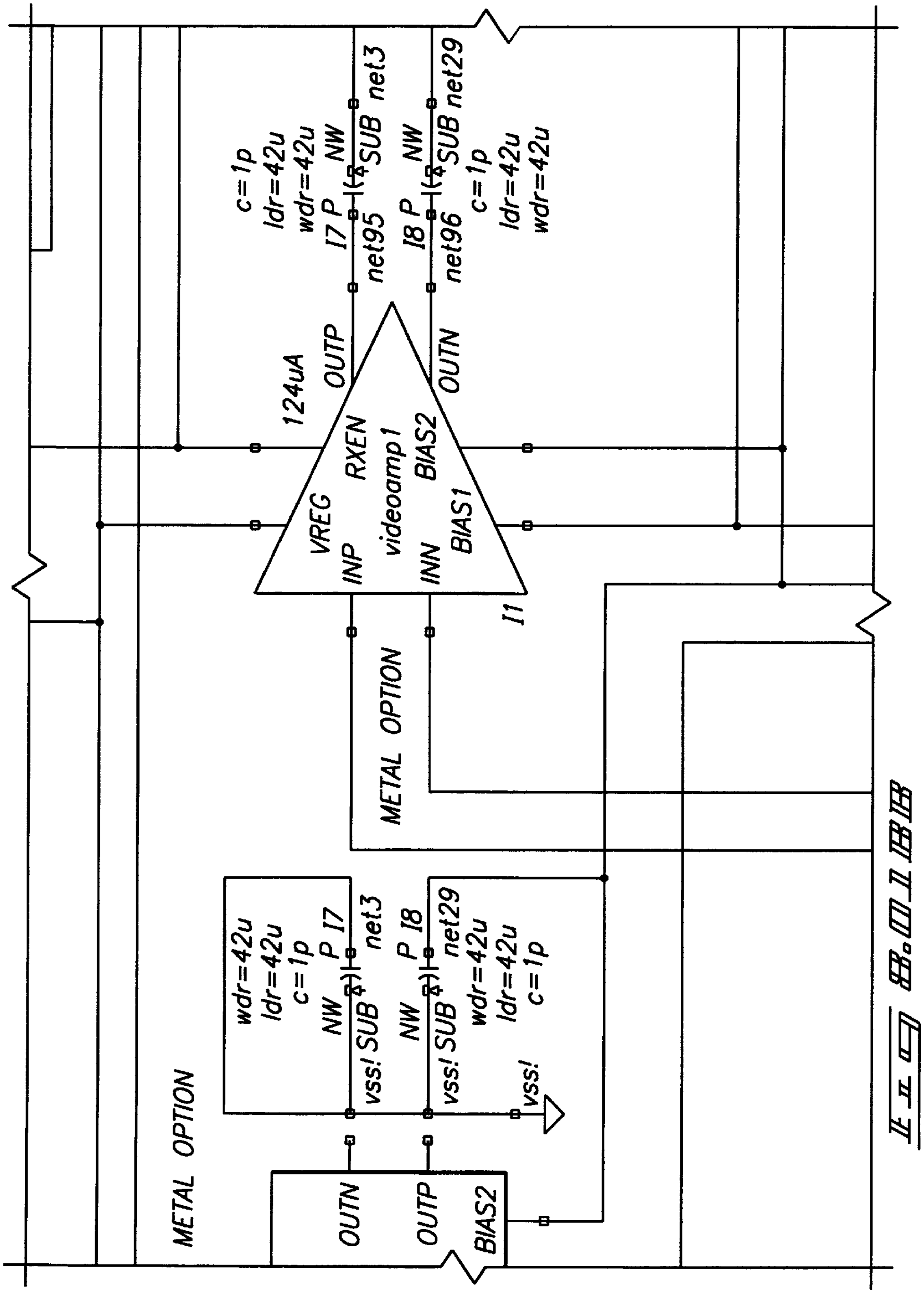
Fig. 8.01BB

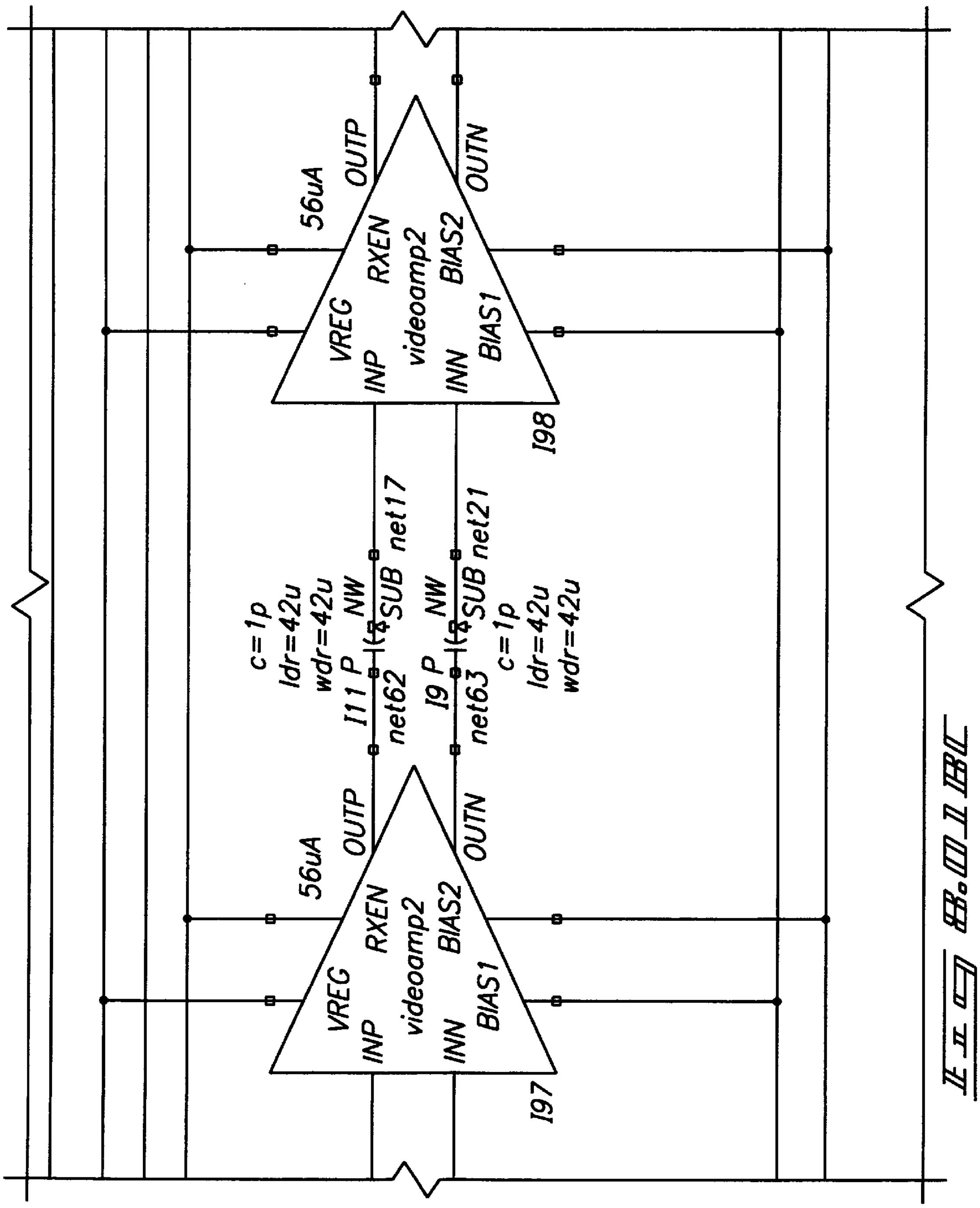
56uA
OUTP
RXEN
VREG
INP
videoamp2
INN
BIAS1
BIAS2
OUTN
I98
net17
NW
SUB
c=1p
ldr=42u
wdr=42u
I11 P
net62
net21
I9 P
net63
56uA
OUTP
RXEN
VREG
INP
videoamp2
INN
BIAS1
BIAS2
OUTN
I97

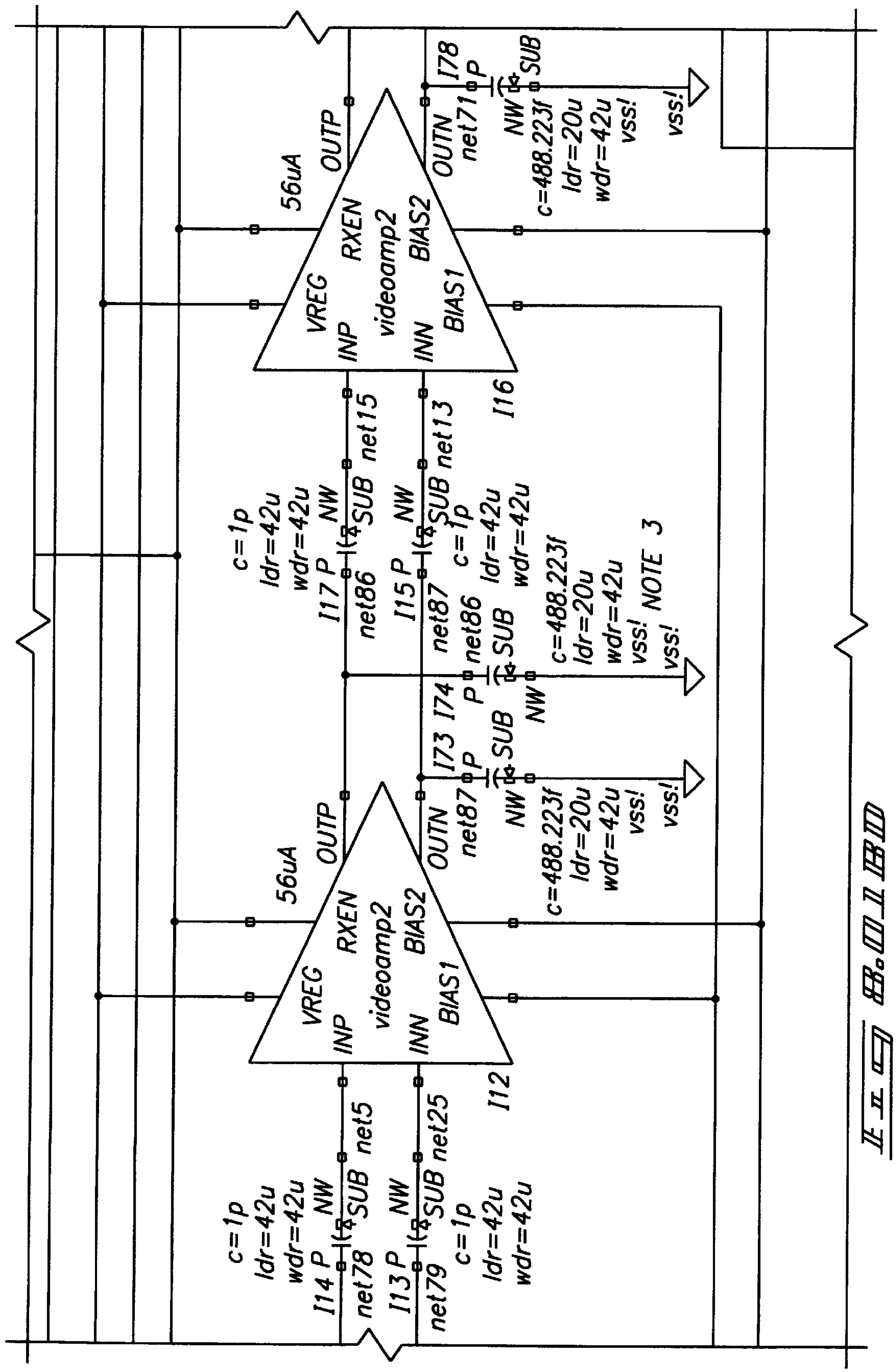
56uA
OUTP
OUTN
VREG
RXEN
INP
videoamp2
INN
BIAS1
BIAS2
I16
I12
net71
I78
P
NW
SUB
c=488.223f
ldr=20u
wdr=42u
vss!
net15
net13
c=1p
ldr=42u
wdr=42u
I17 P
I15 P
net86
net87
I74
I73
NOTE 3
net5
net25
I14 P
I13 P
net78
net79

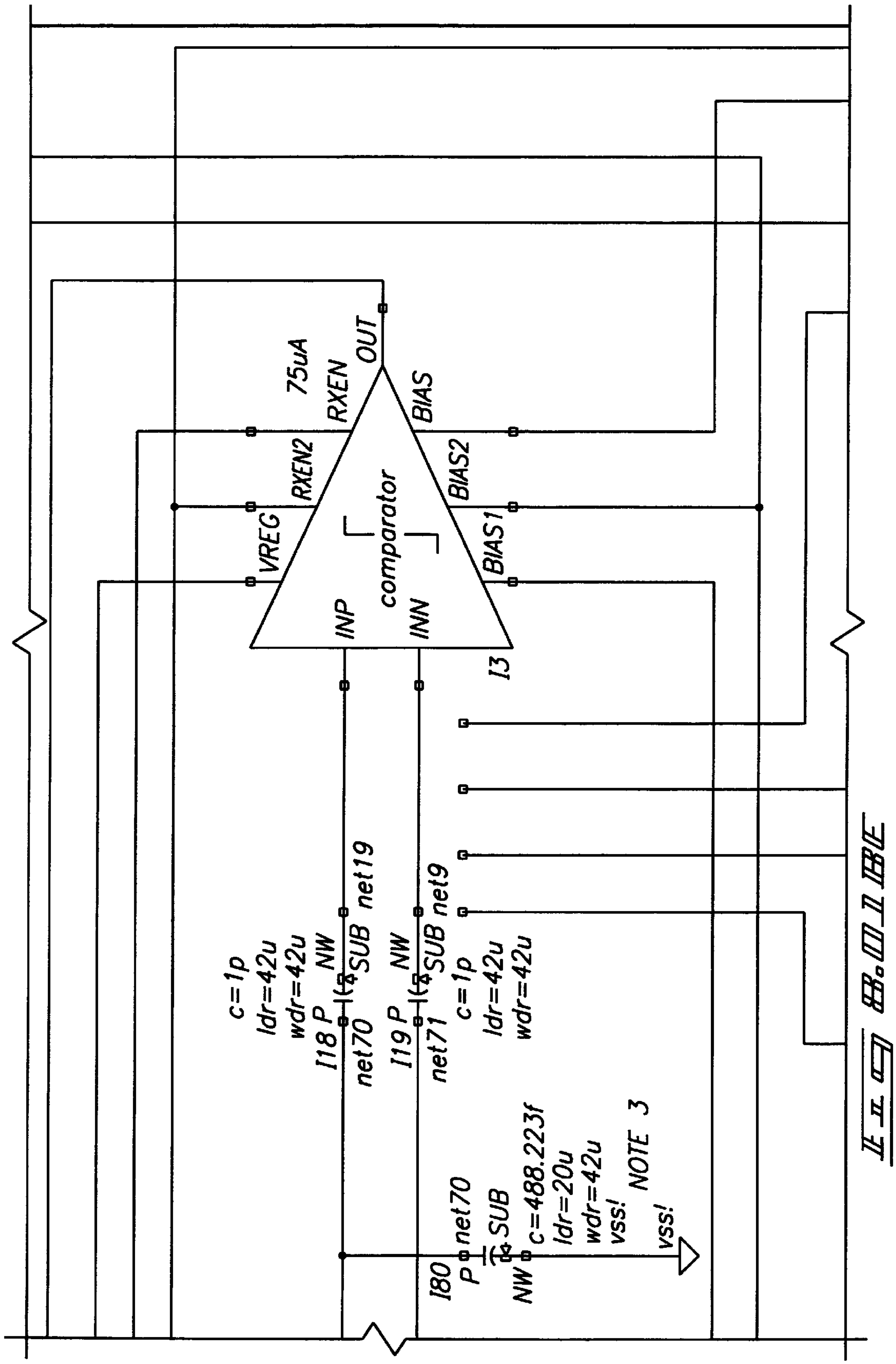
FIG. 8.011BE

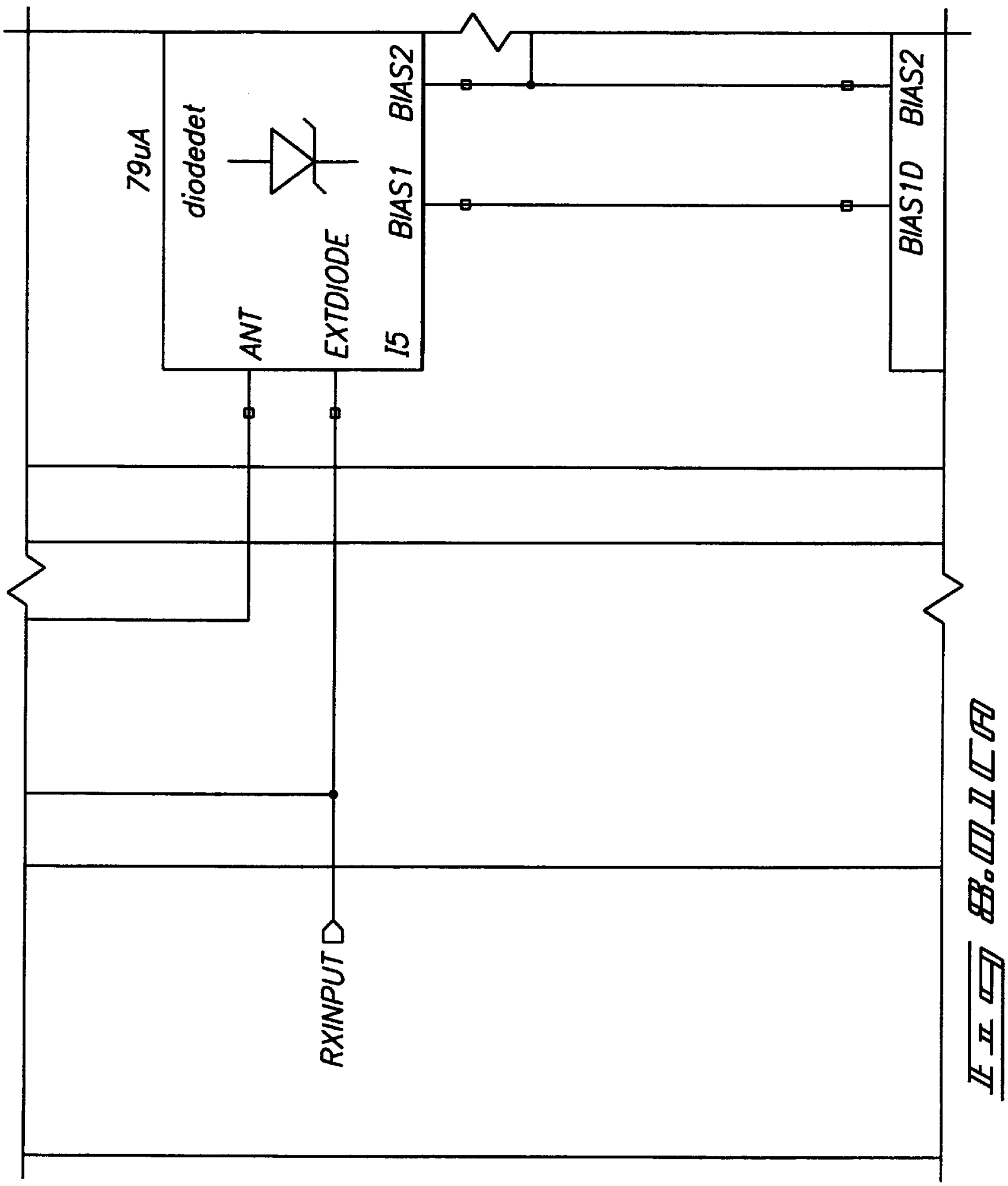
Fig. 8.01CA

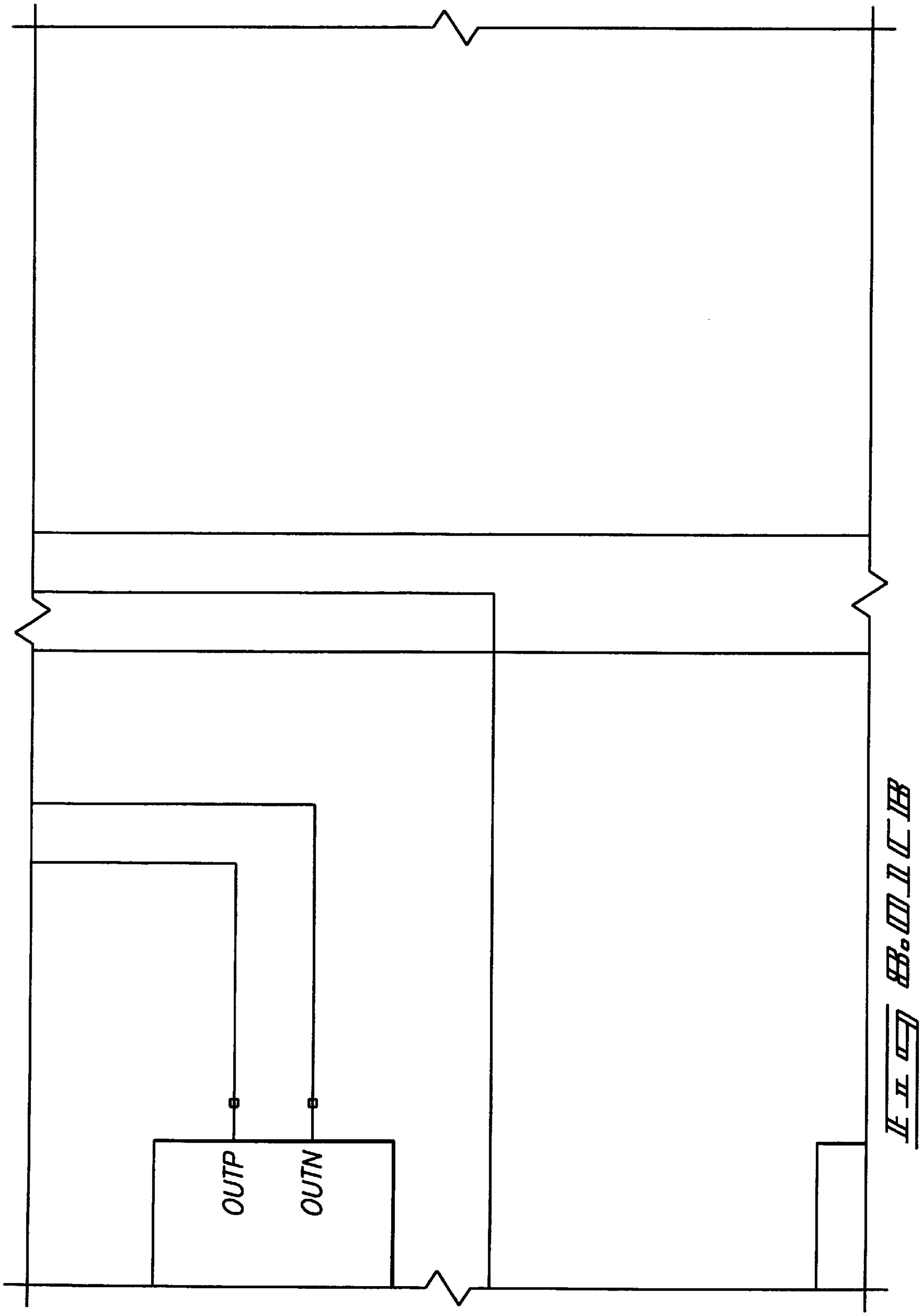
FIG. 8.01CB

GAIN (diff) FROM OUTPUT OF DETECTOR TO INPUT OF COMPARATOR = 74dB
LOWER 3dB FREQUENCY = 168KHz
UPPER 3dB FREQUENCY = 6.5MHz
COMPARATOR HYSTERESIS = 28mV EACH SIDE OF EQUAL

Fig 8.01CC

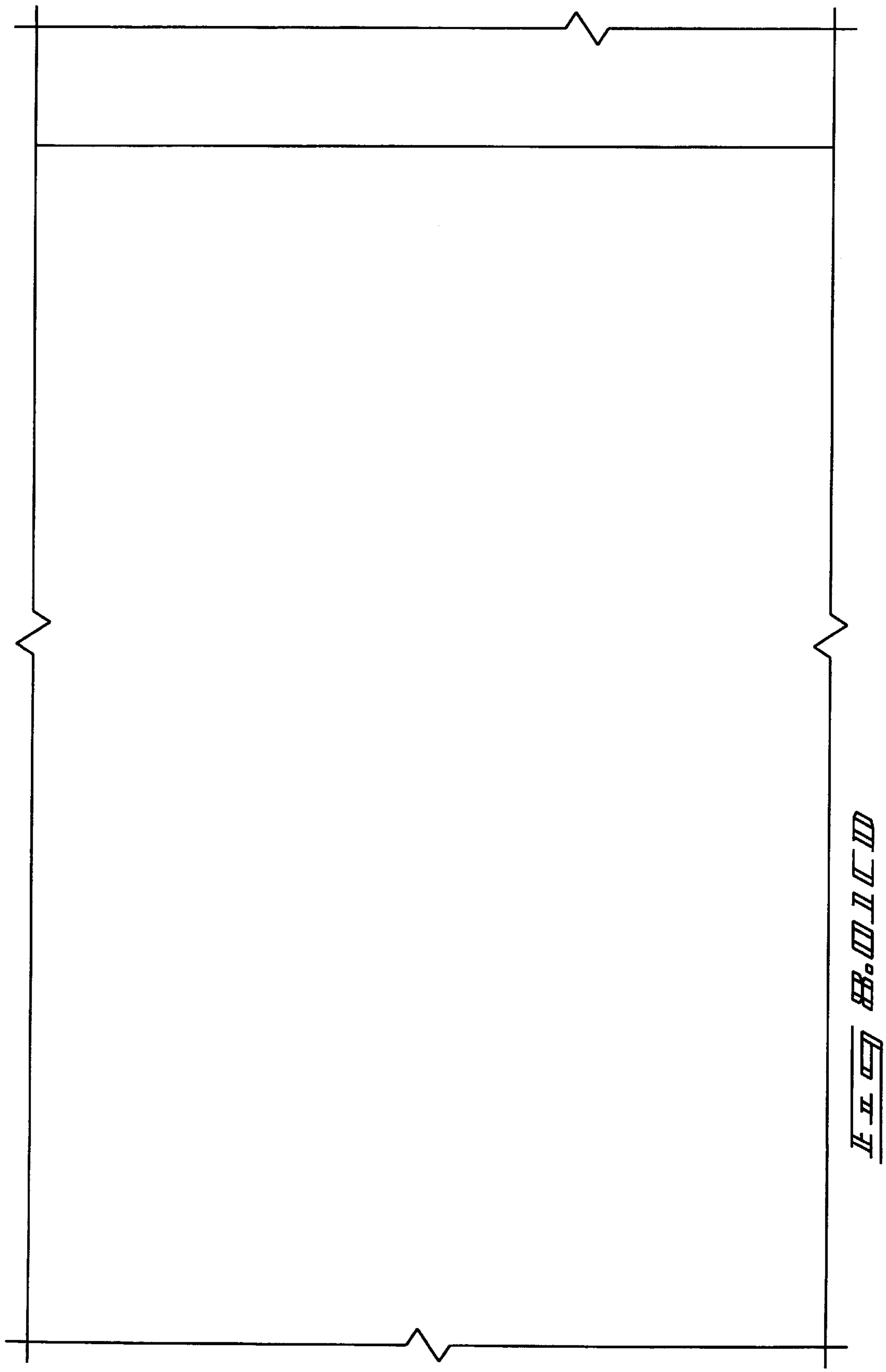
FIG. 8.01CD

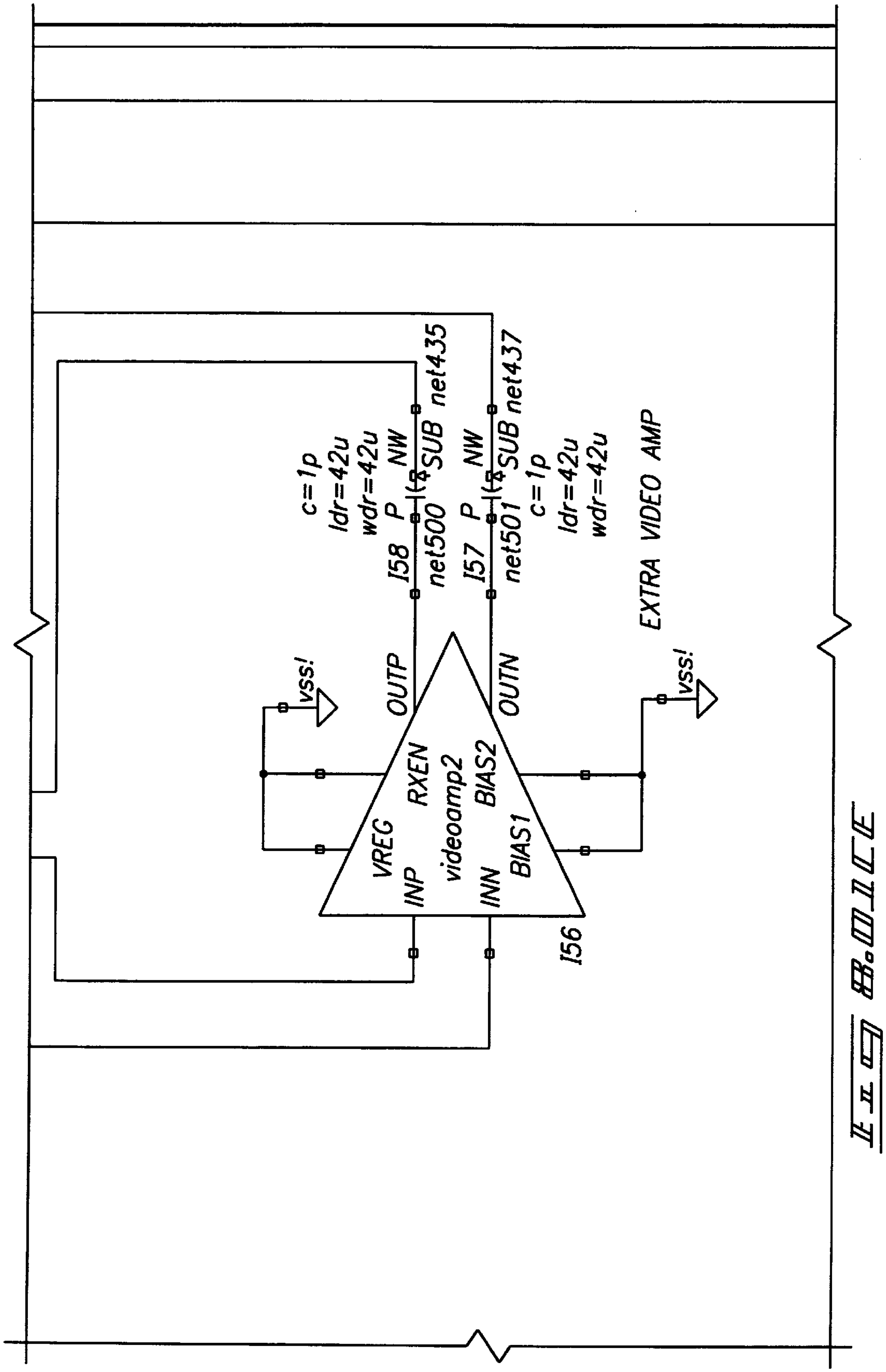
Fig. 8.011CE

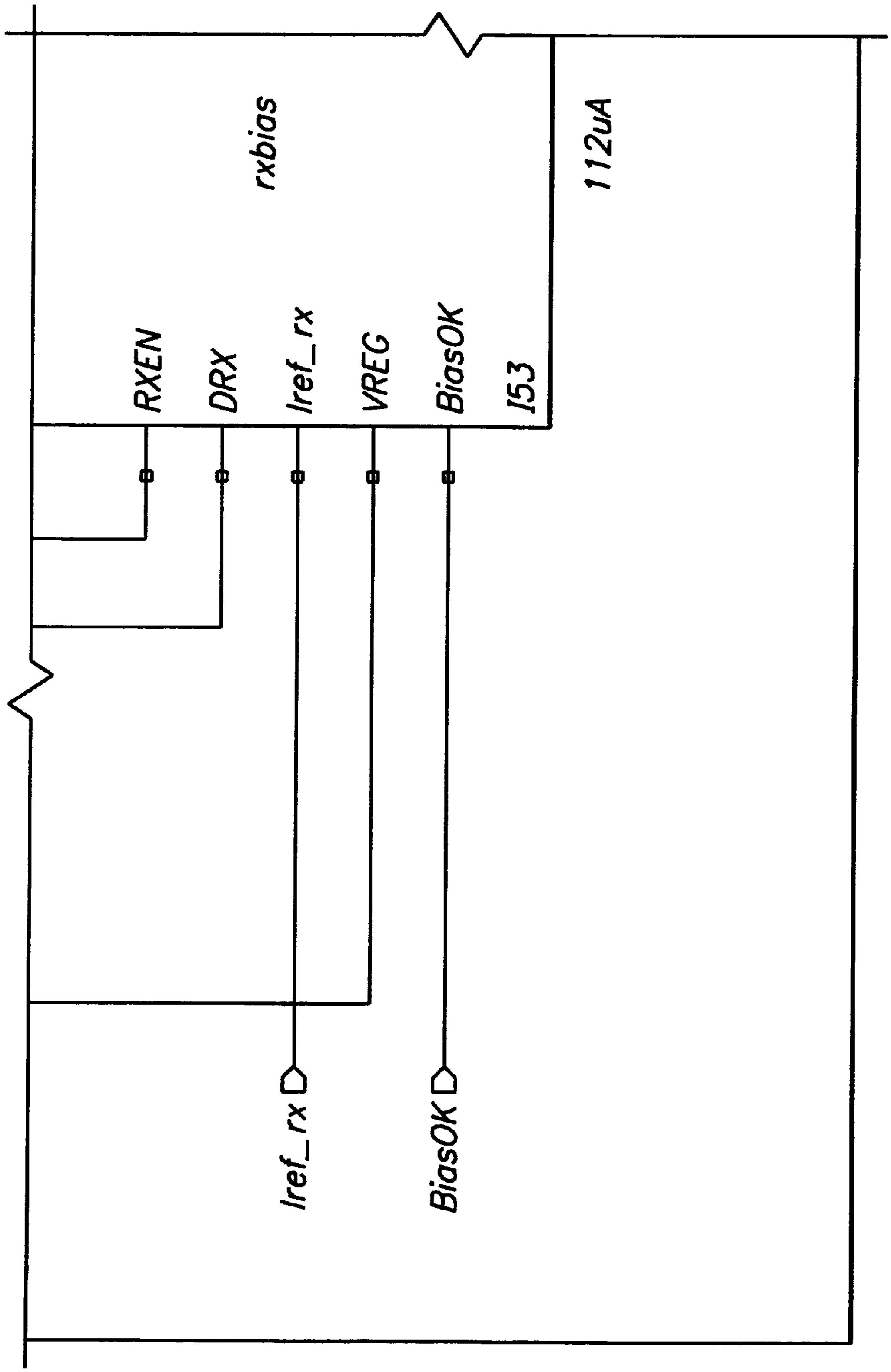
FIG. 8.01DA

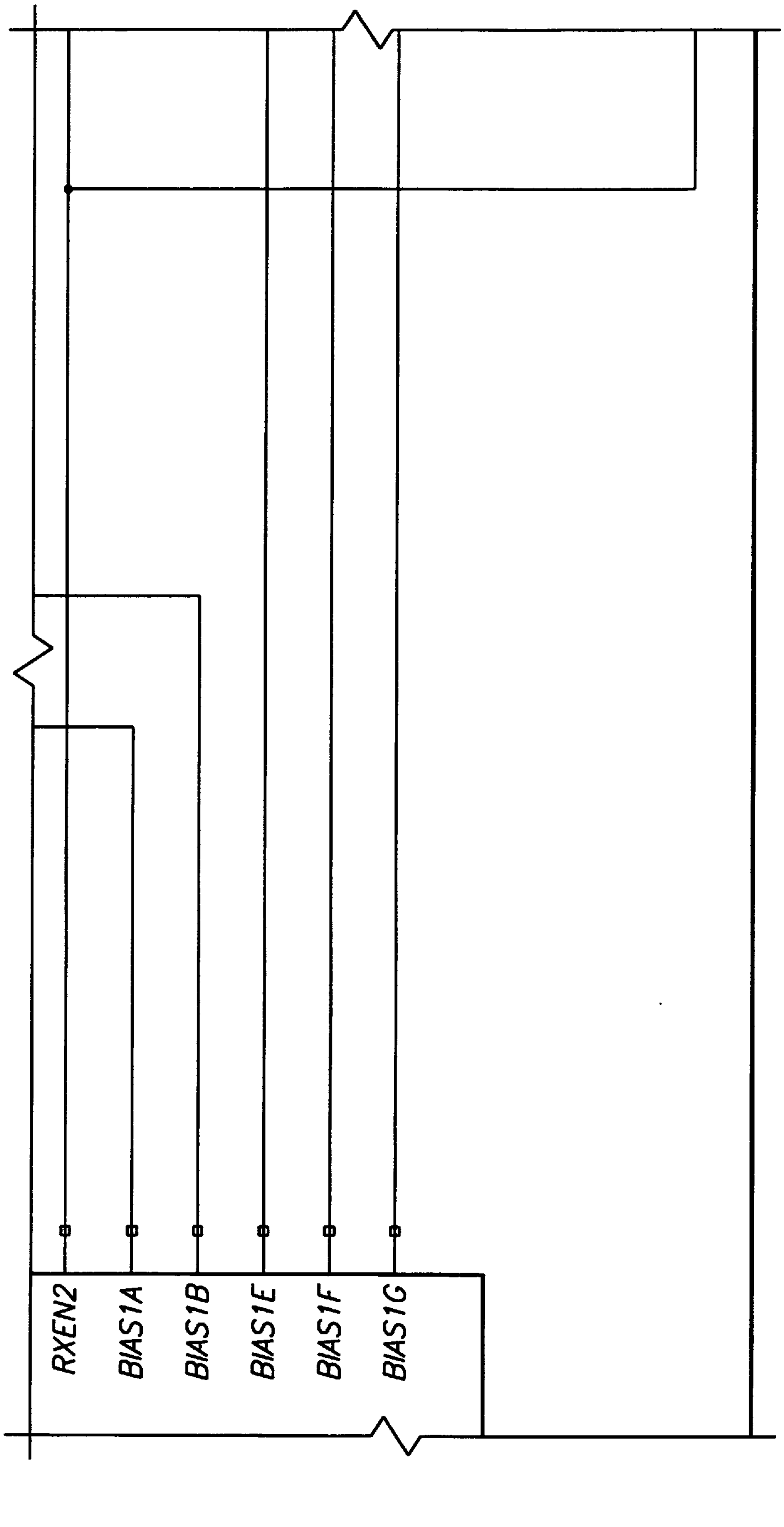
Fig. 8.01DB

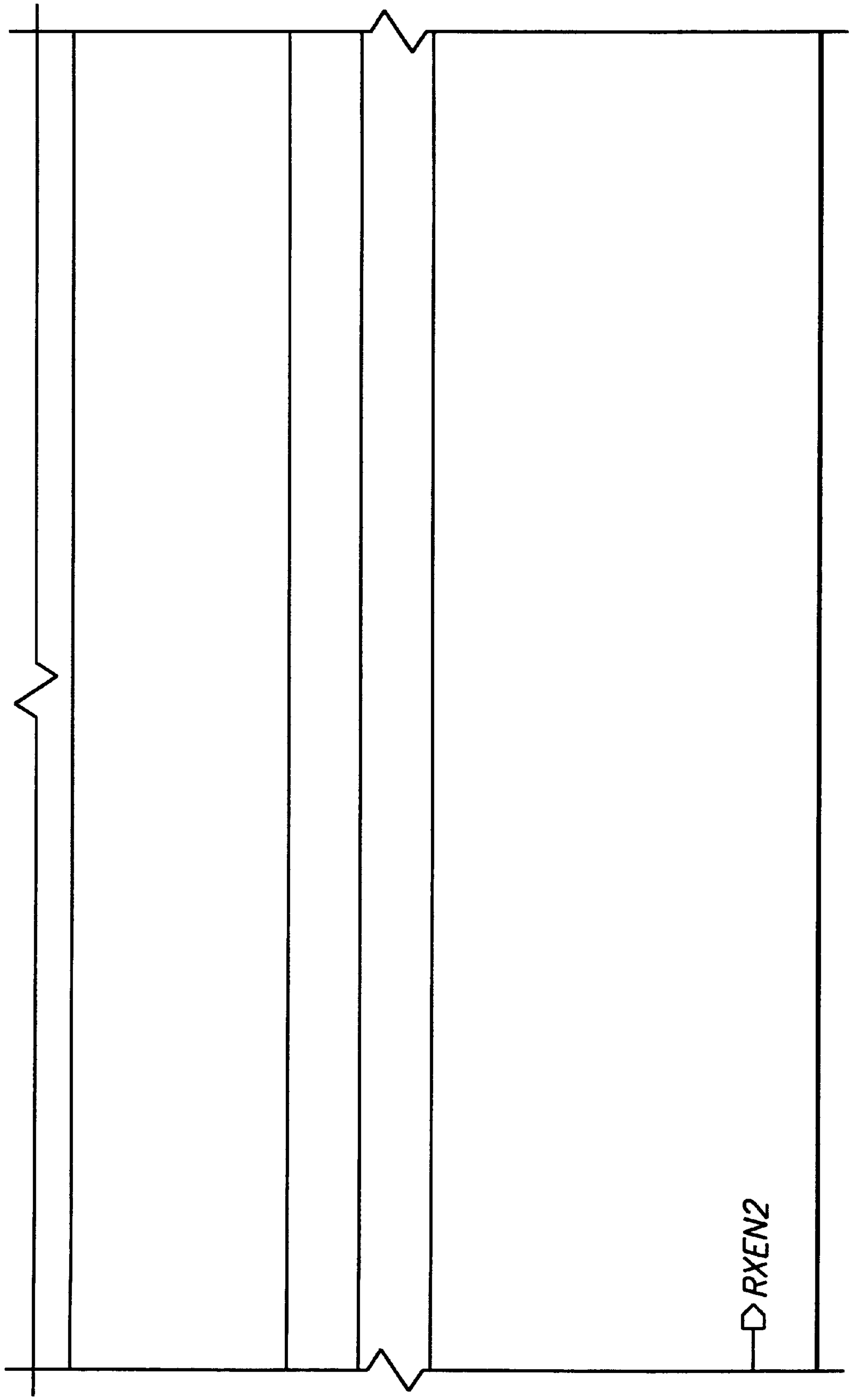
Fig. 8.01DC

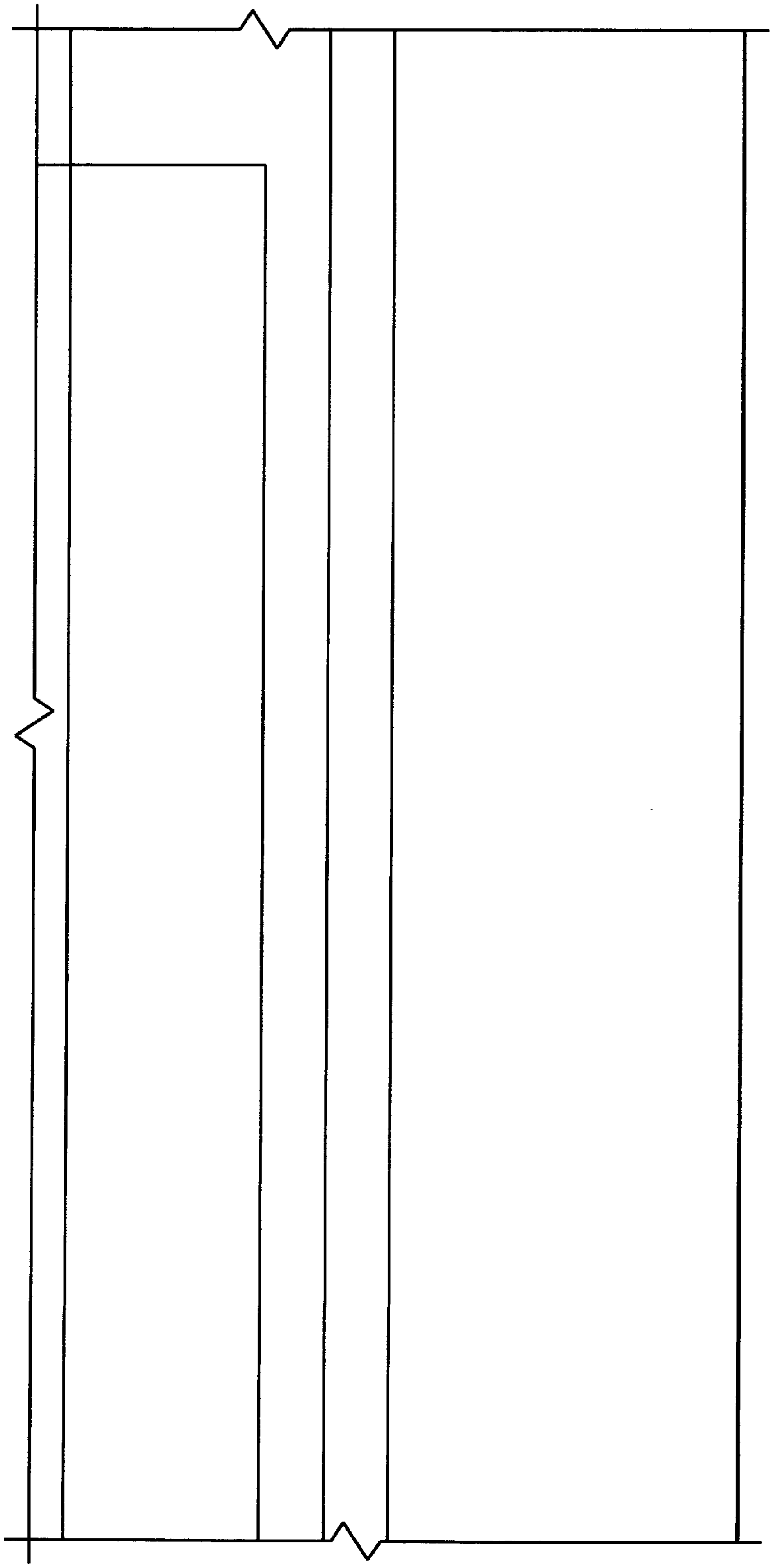
Fig. 8.010D

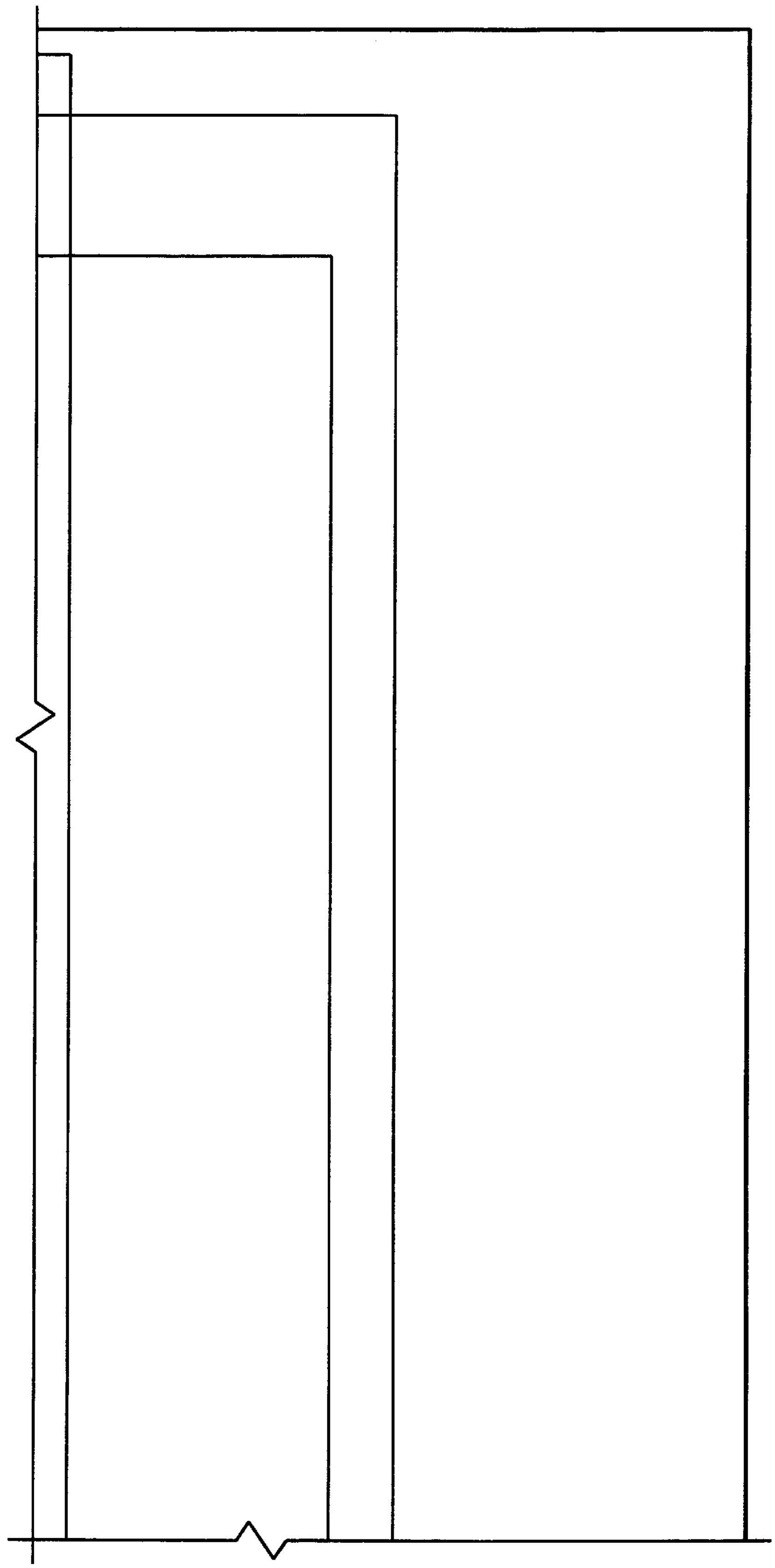
FIG. 8.01DE

| | |
|---|---|
| 8.0101AA | 8.0101AB |
| 8.0101BA | 8.0101BB |
| 8.0101CA | 8.0101CB |

Fig. 8.0101

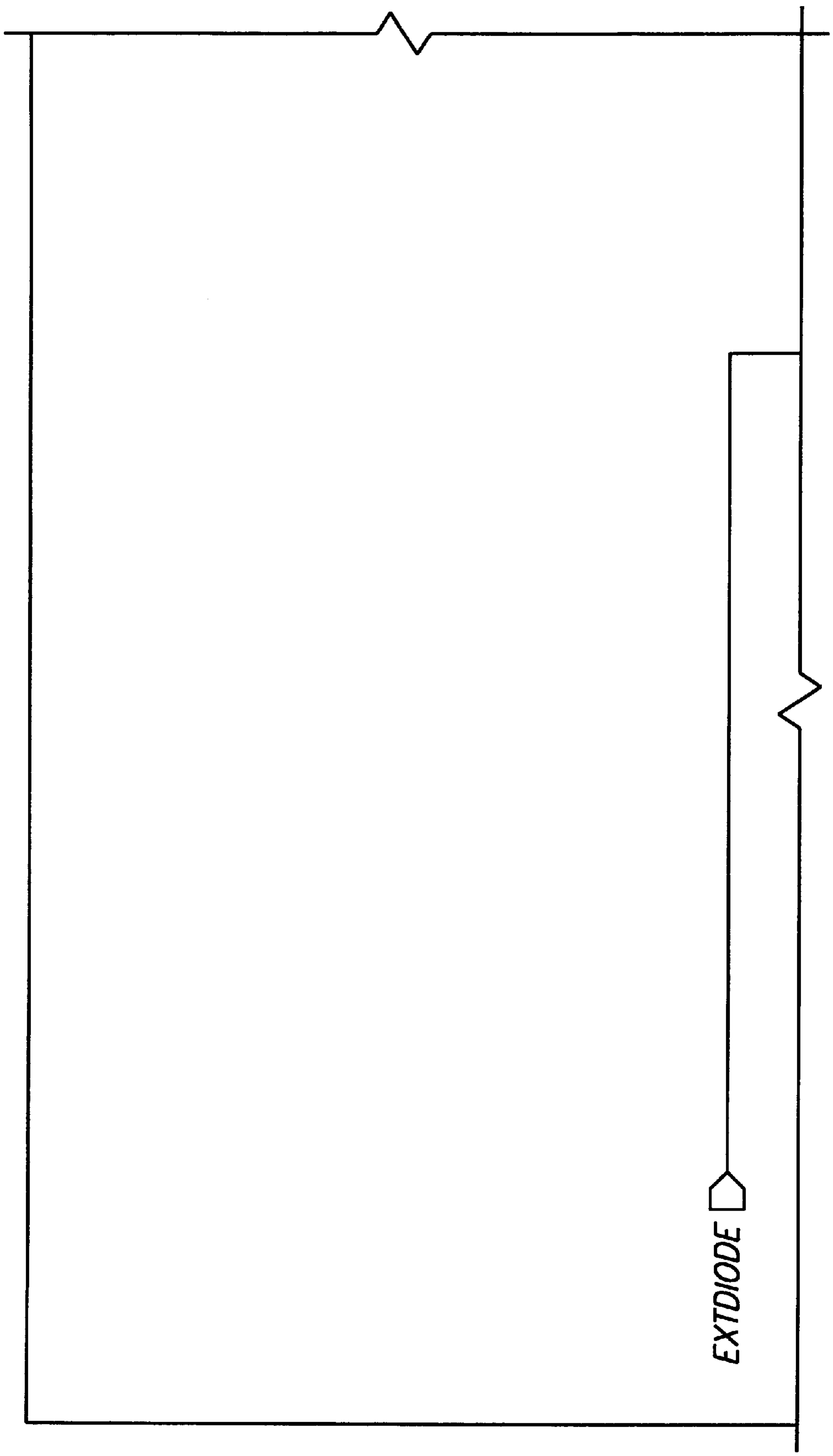
FIG. 8.0101AA

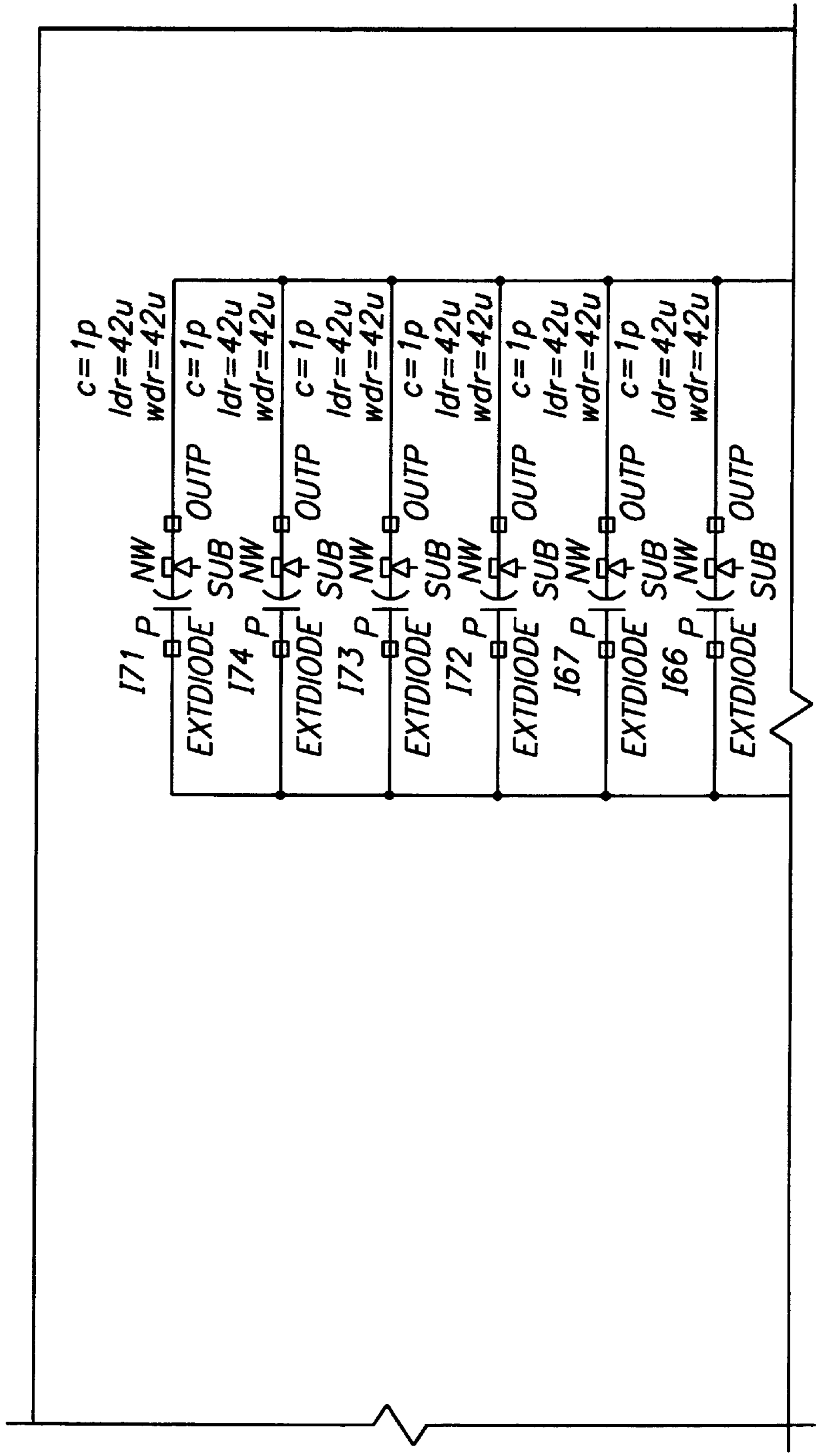
Fig. 8.0101AB

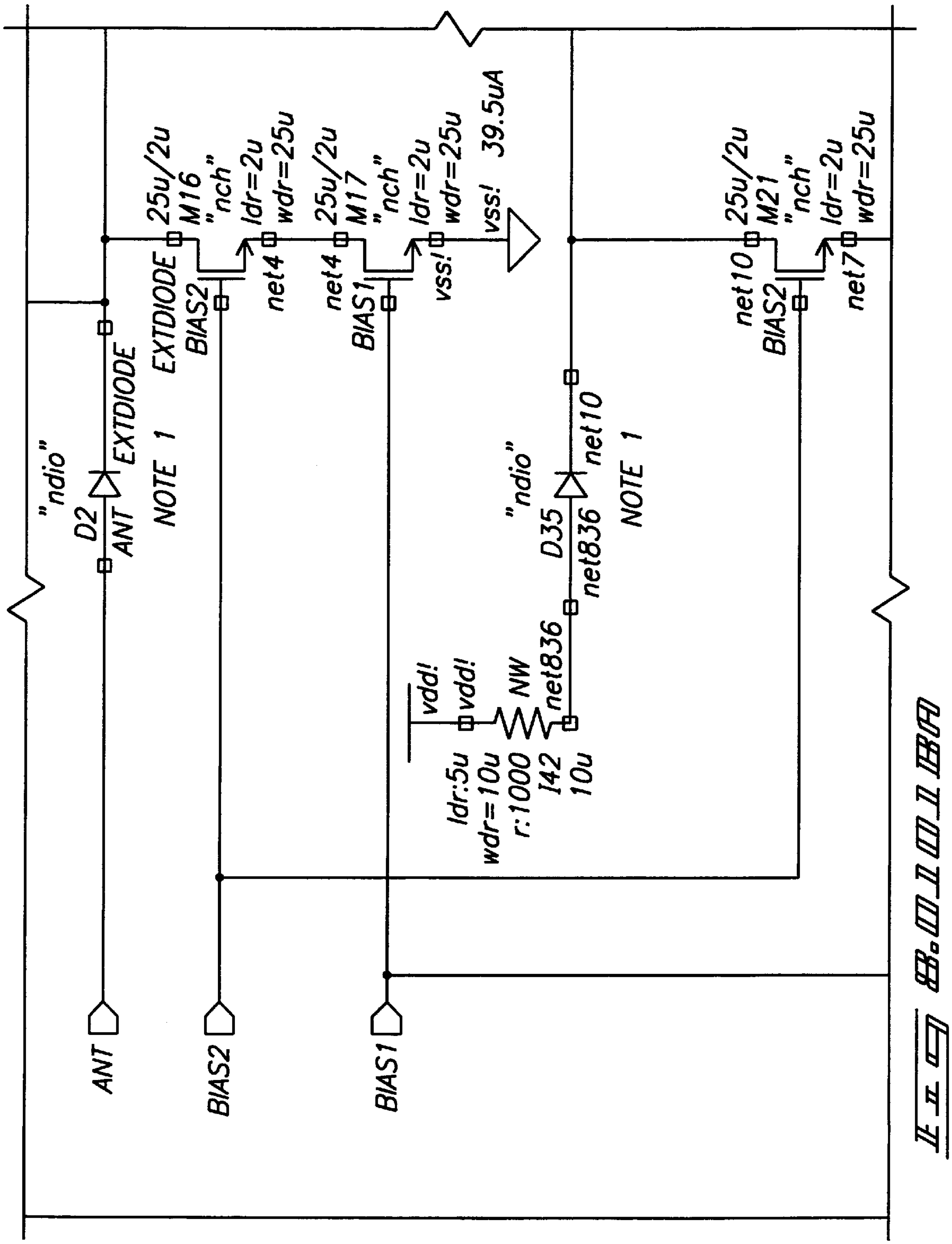
FIG. 8.0101BA

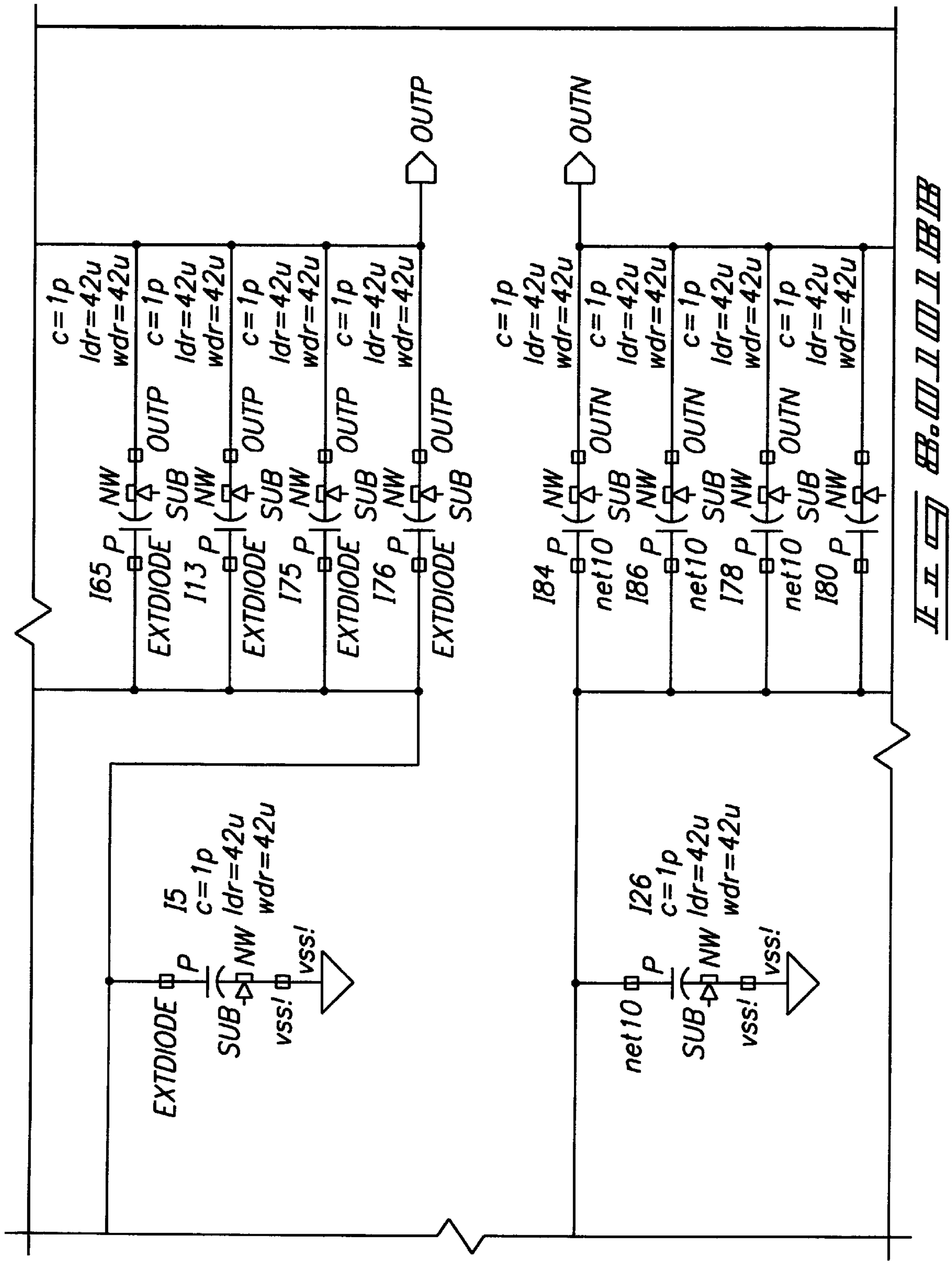
Fig. 8.0.1.0.1BB

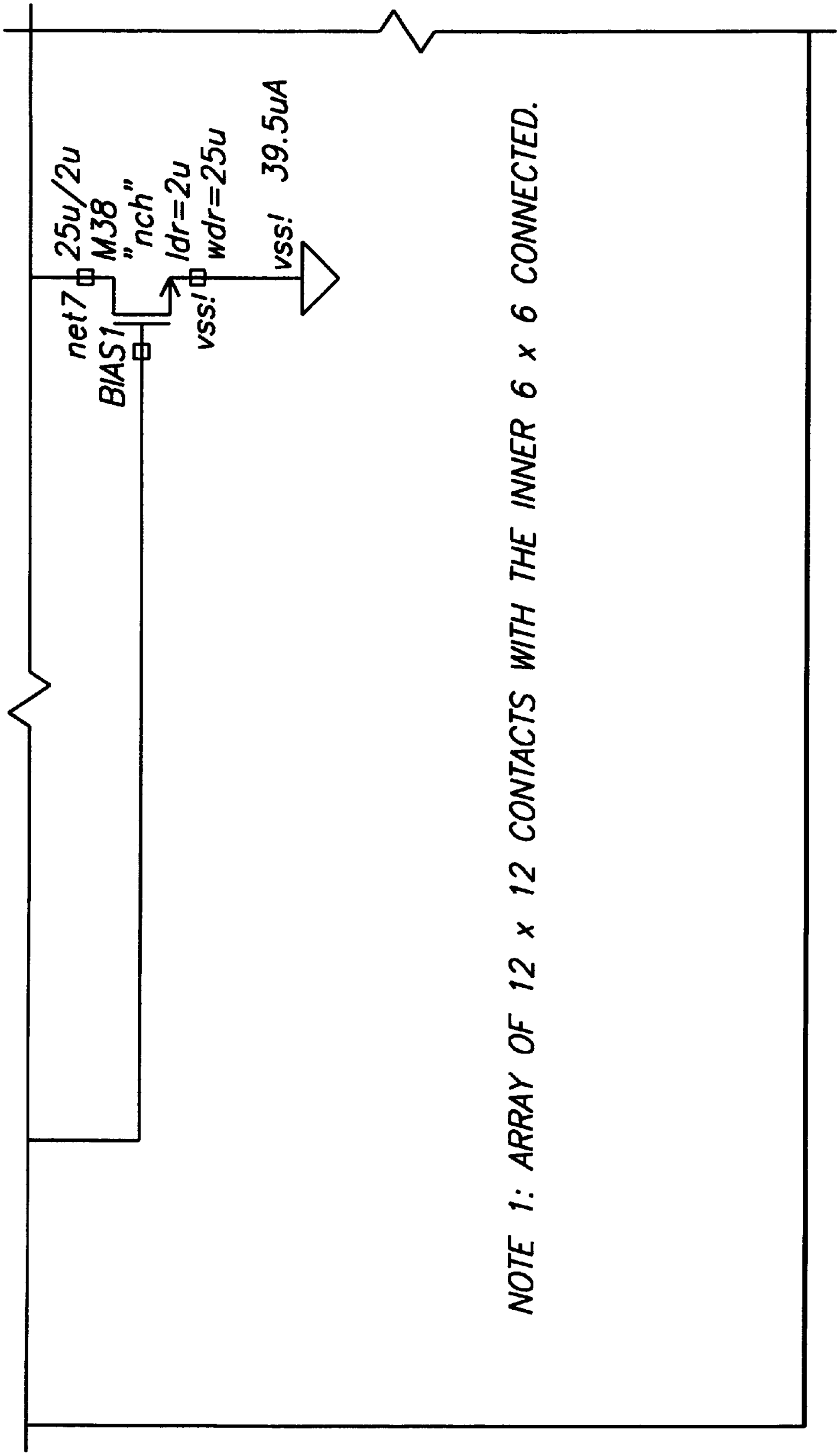
FIG. 8.0101CA

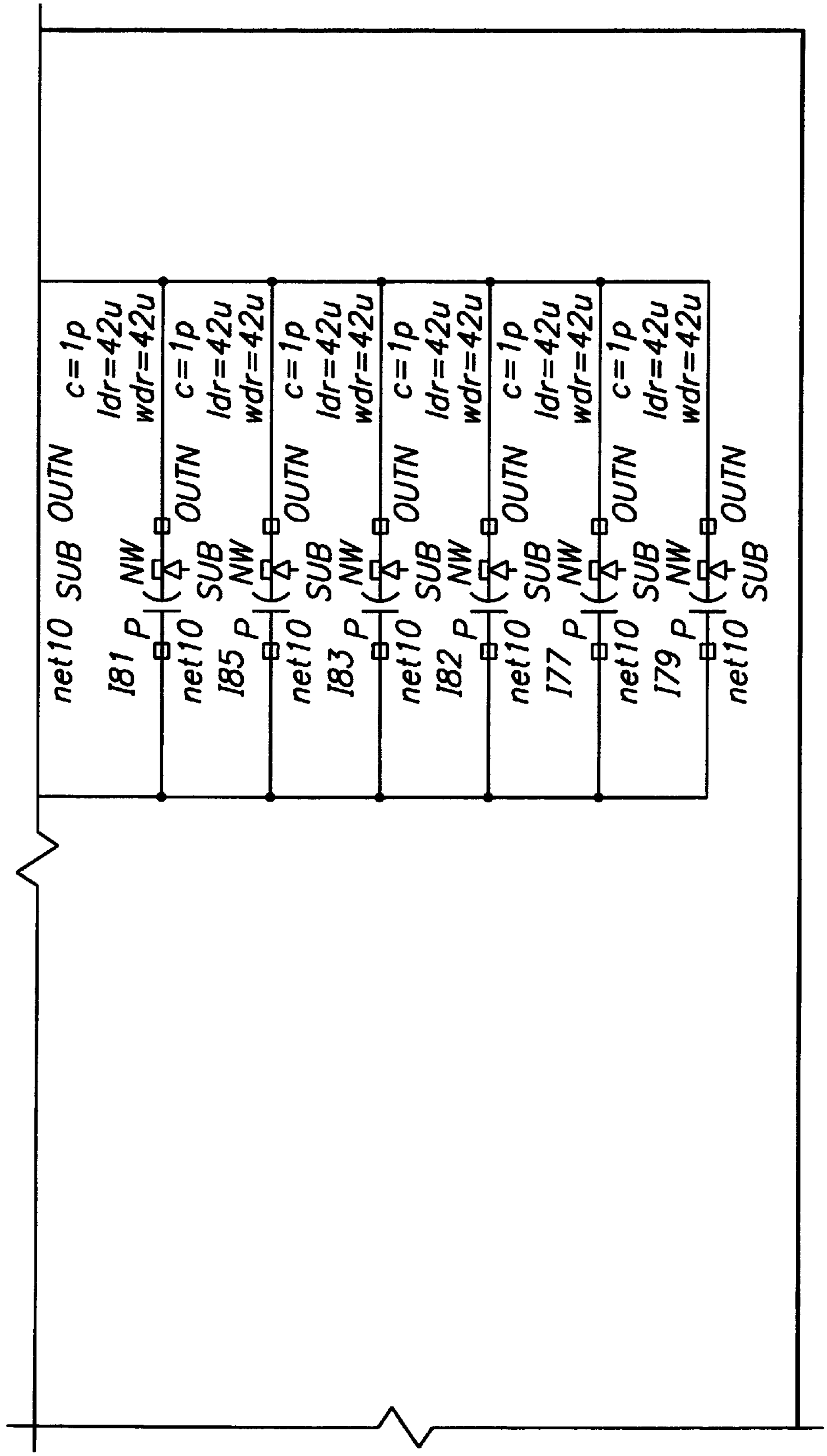
net10 SUB OUTN
c=1p
ldr=42u
wdr=42u
I81
I85
I83
I82
I77
I79
P
NW
SUB
OUTN
net10

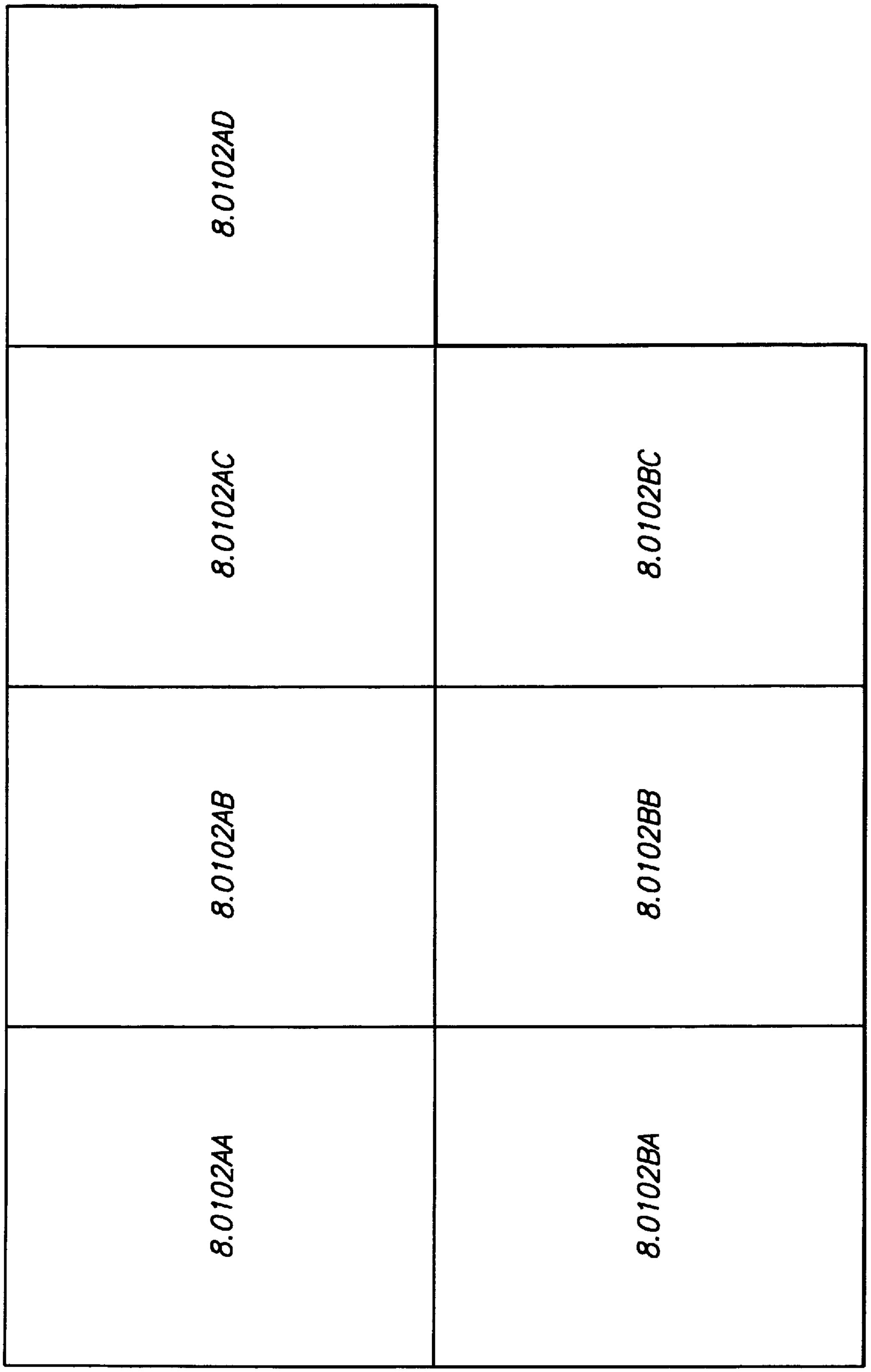
Fig. 8.0102

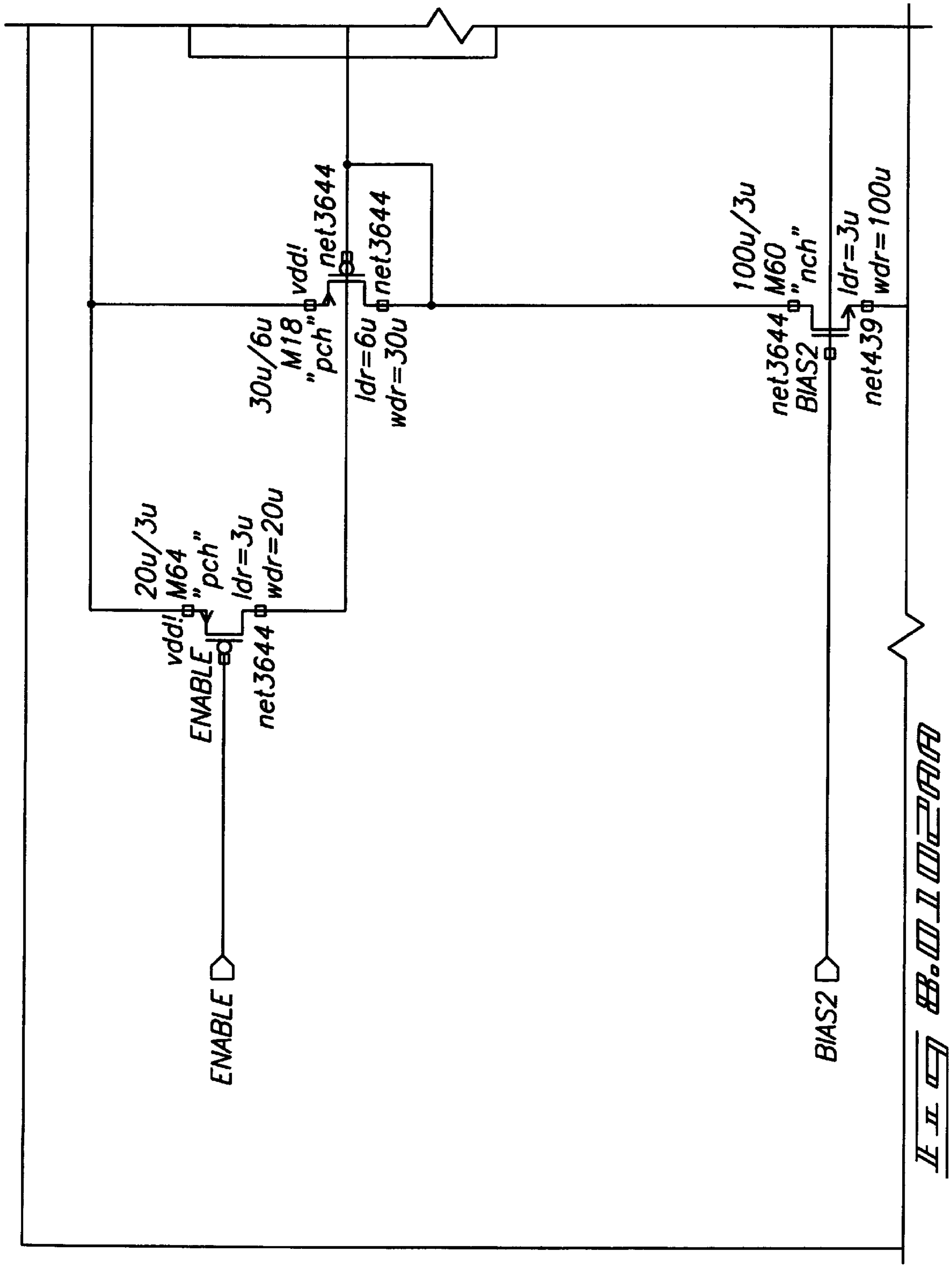
FIG. 8.0110.2AA

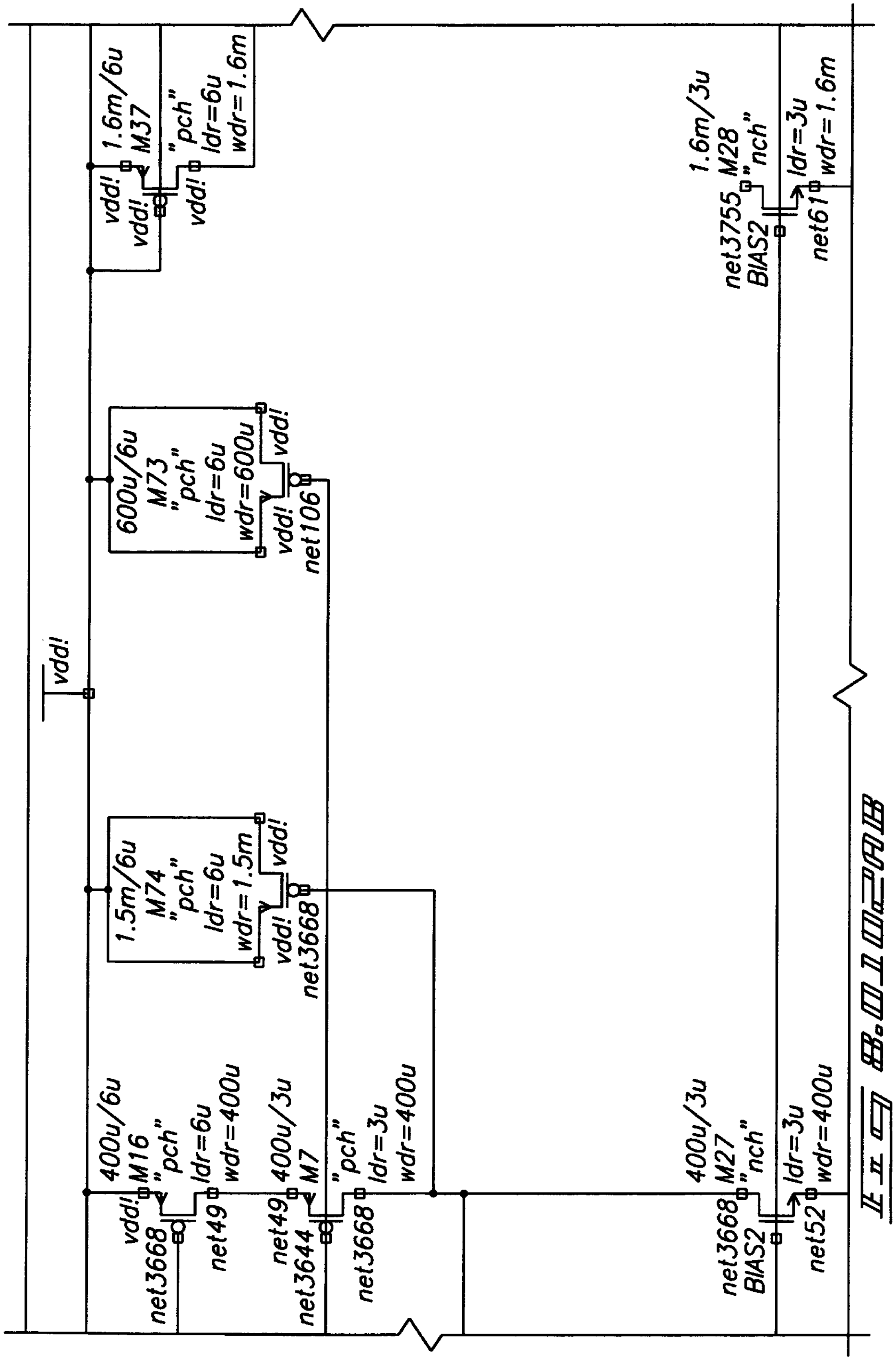
Fig. 8.010.2AB

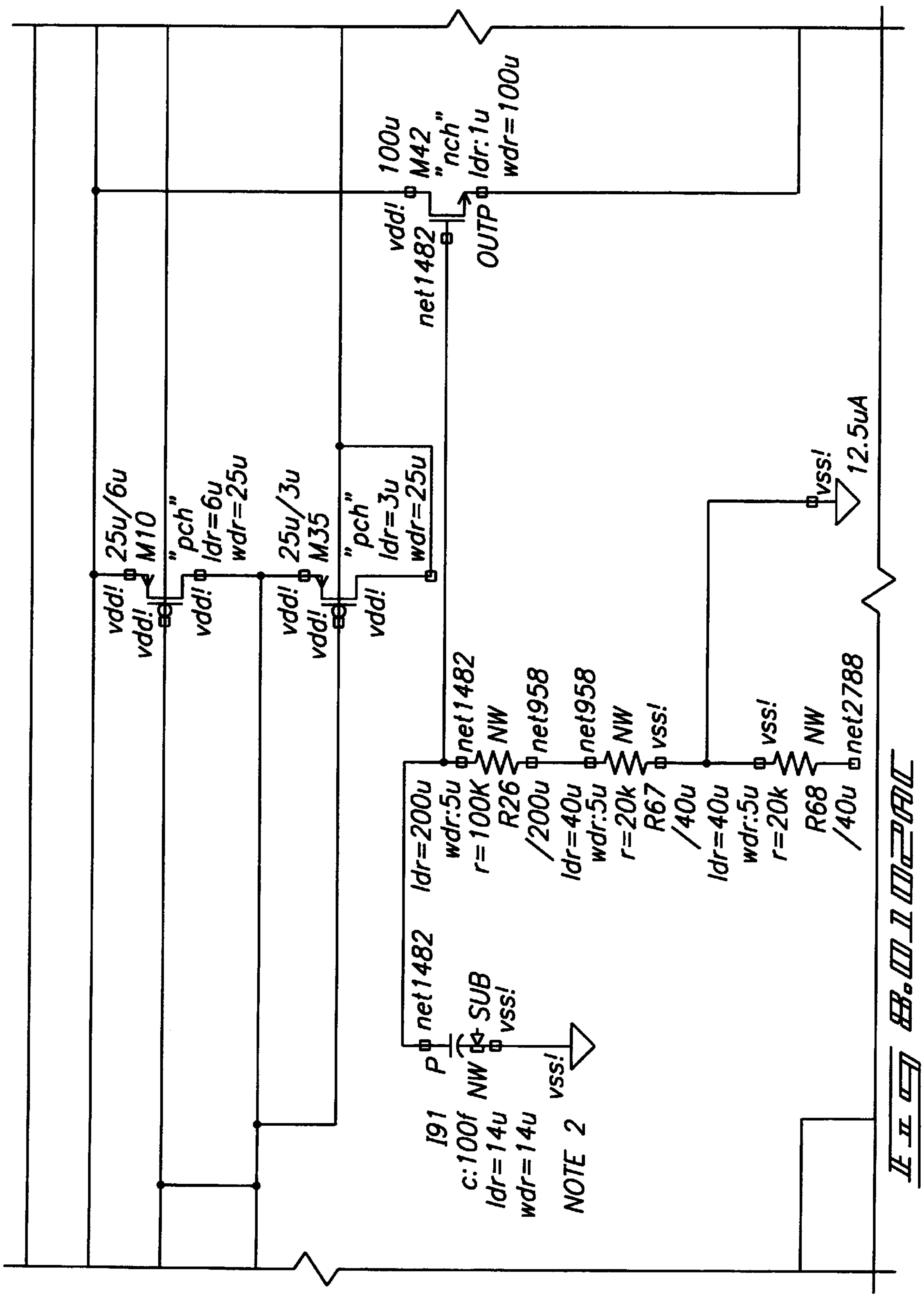
M42
"nch"
ldr:1u
wdr=100u
100u
vdd!
net1482
OUTP
M10
"pch"
ldr=6u
wdr=25u
25u/6u
M35
"pch"
ldr=3u
wdr=25u
25u/3u
vss!
12.5uA
net958
net2788
NW
R26
r=100K
wdr:5u
ldr=200u
/200u
R67
r=20k
/40u
ldr=40u
R68
I91
c:100f
ldr=14u
wdr=14u
SUB
NOTE 2

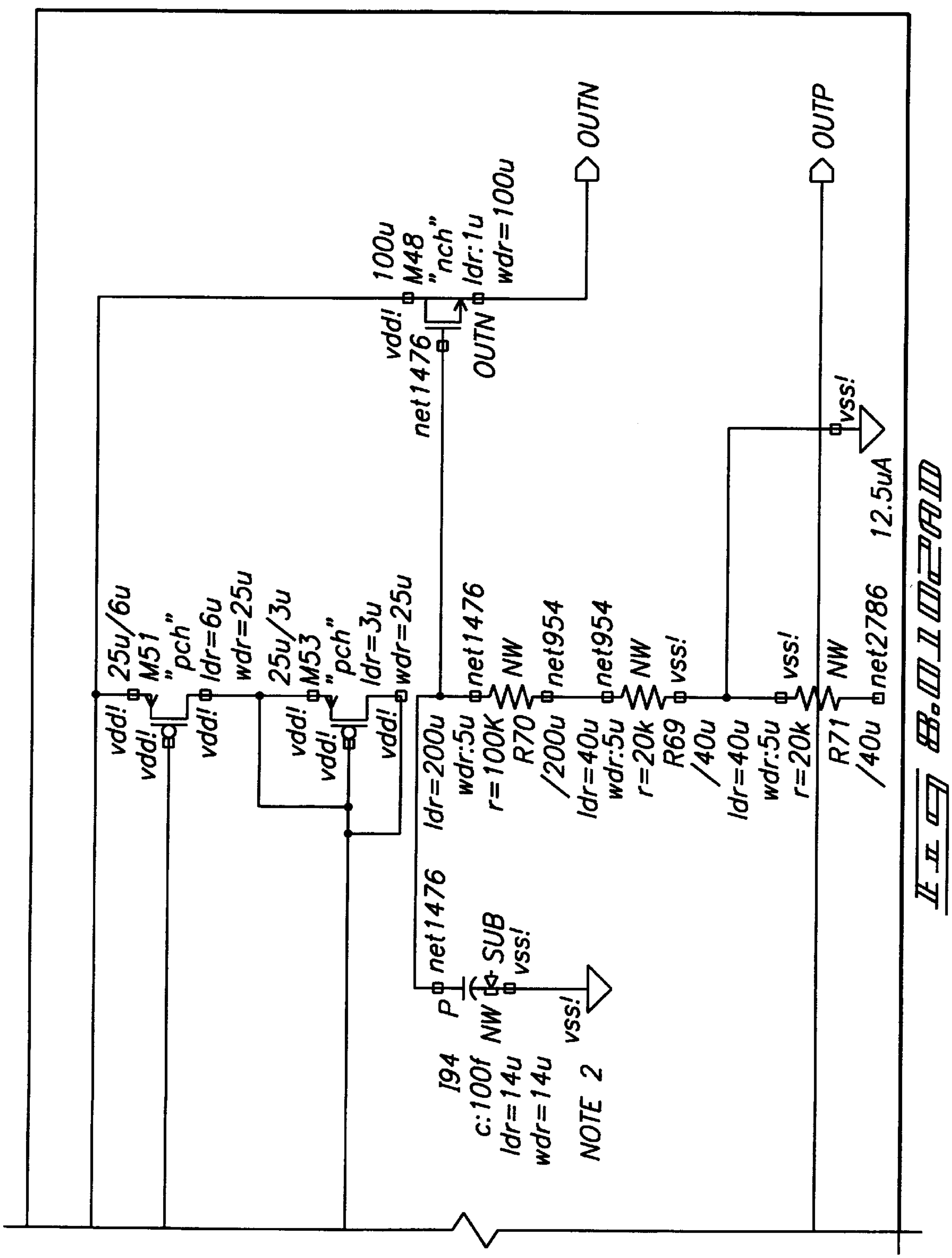
OUTN
OUTP
vdd!
100u
M48
"nch"
ldr:1u
wdr=100u
net1476
OUTN
vss!
12.5uA
25u/6u
M51
"pch"
ldr=6u
wdr=25u
25u/3u
M53
"pch"
ldr=3u
wdr=25u
net1476
NW
net954
net954
NW
vss!
vss!
NW
net2786
ldr=200u
wdr:5u
r=100K
R70
/200u
ldr=40u
wdr:5u
r=20k
R69
/40u
ldr=40u
wdr:5u
r=20k
R71
/40u
net1476
SUB
vss!
P
NW
vss!
I94
c:100f
ldr=14u
wdr=14u
NOTE 2

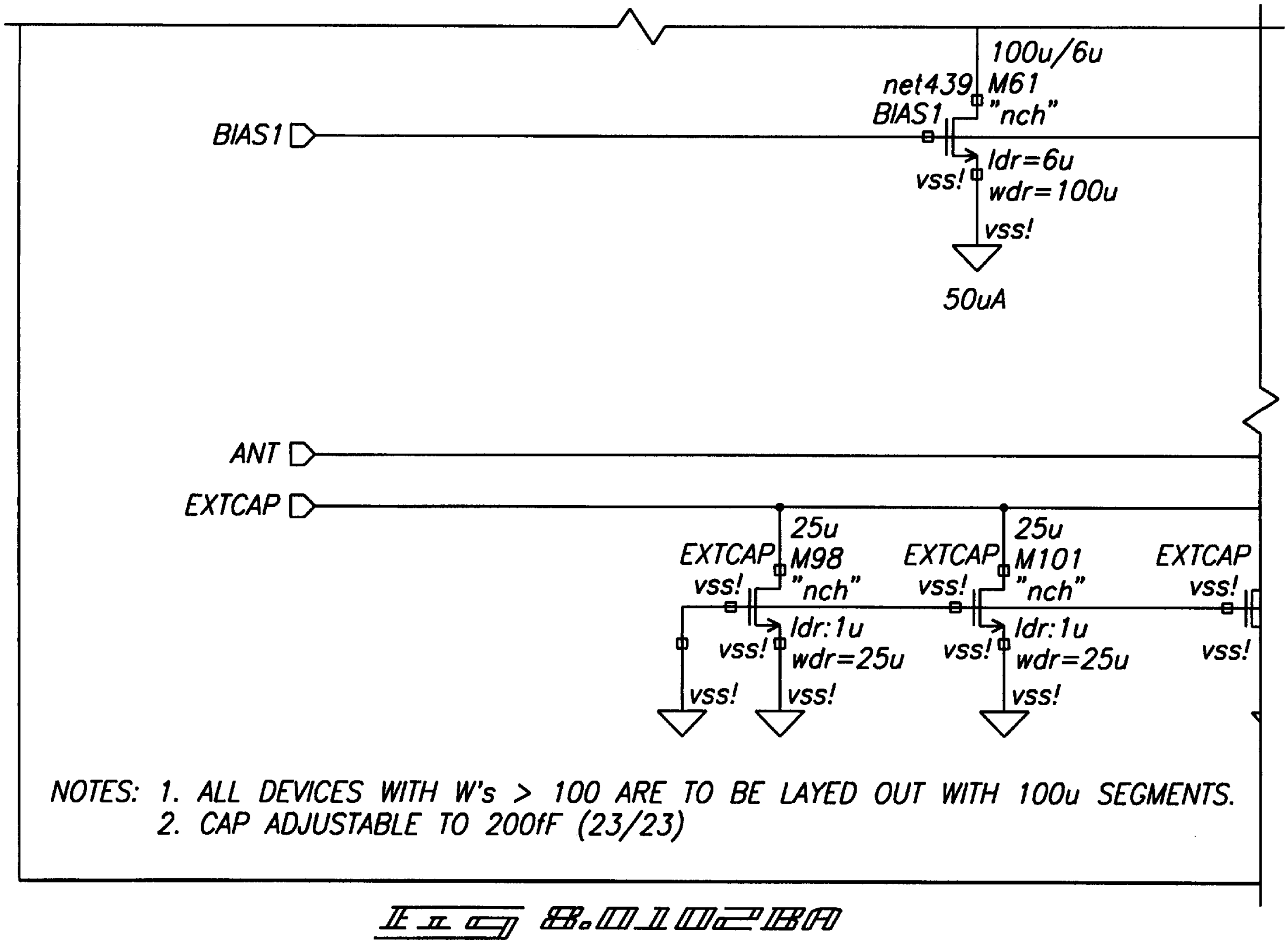
FIG. 8.0102BA

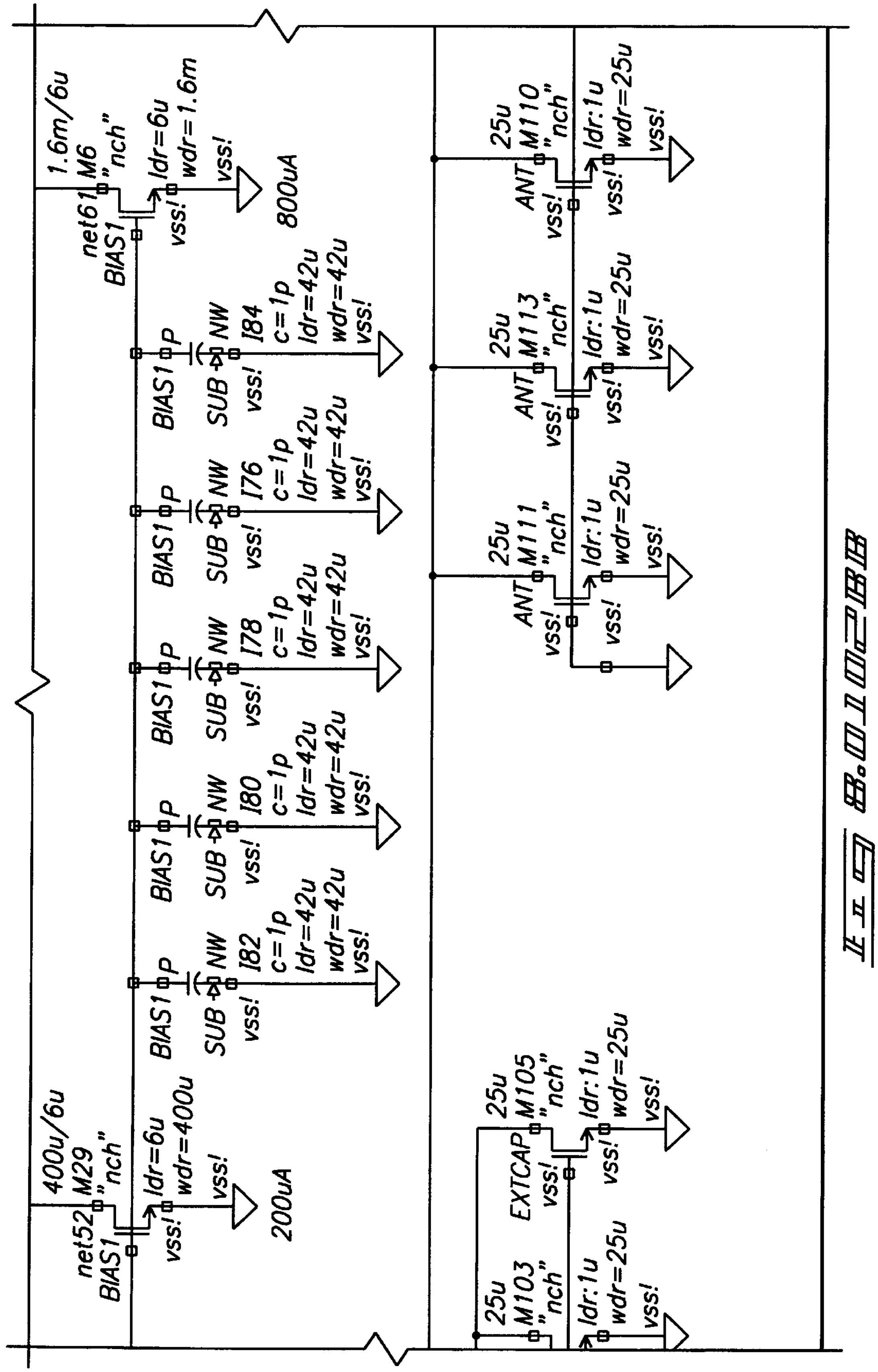
Fig. 8.010.2B

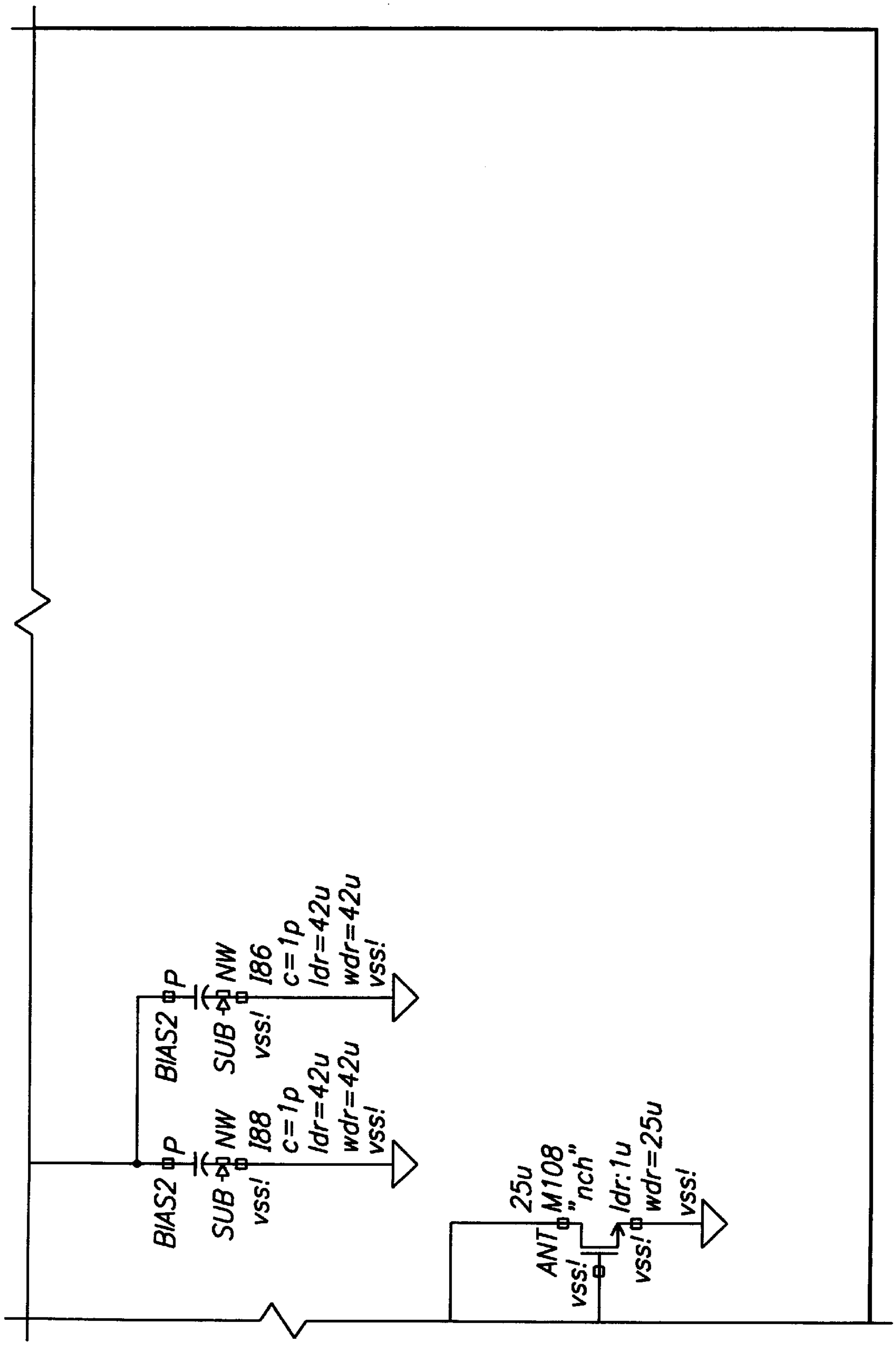
Fig. 8.0102BC

| | | | | | |
|---|---|---|---|---|---|
| 8.0103AA | 8.0103AB | 8.0103AC | 8.0103AD | 8.0103AE | 8.0103AF |
| 8.0103BA | 8.0103BB | 8.0103BC | 8.0103BD | 8.0103BE | 8.0103BF |
| 8.0103CA | 8.0103CB | 8.0103CC | 8.0103CD | 8.0103CE | 8.0103CF |

FIG. 8.0103

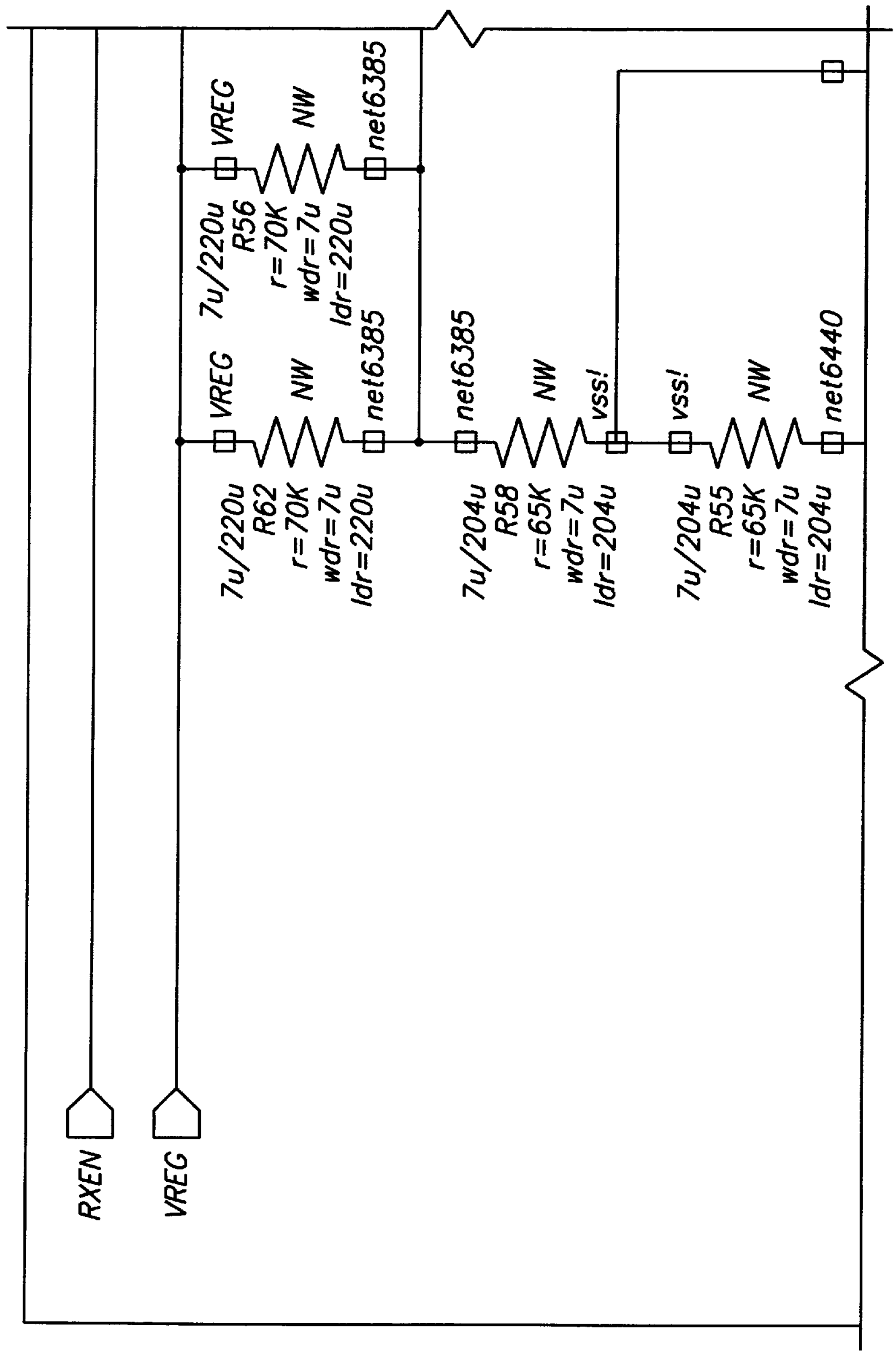
FIG. 8.0103AA

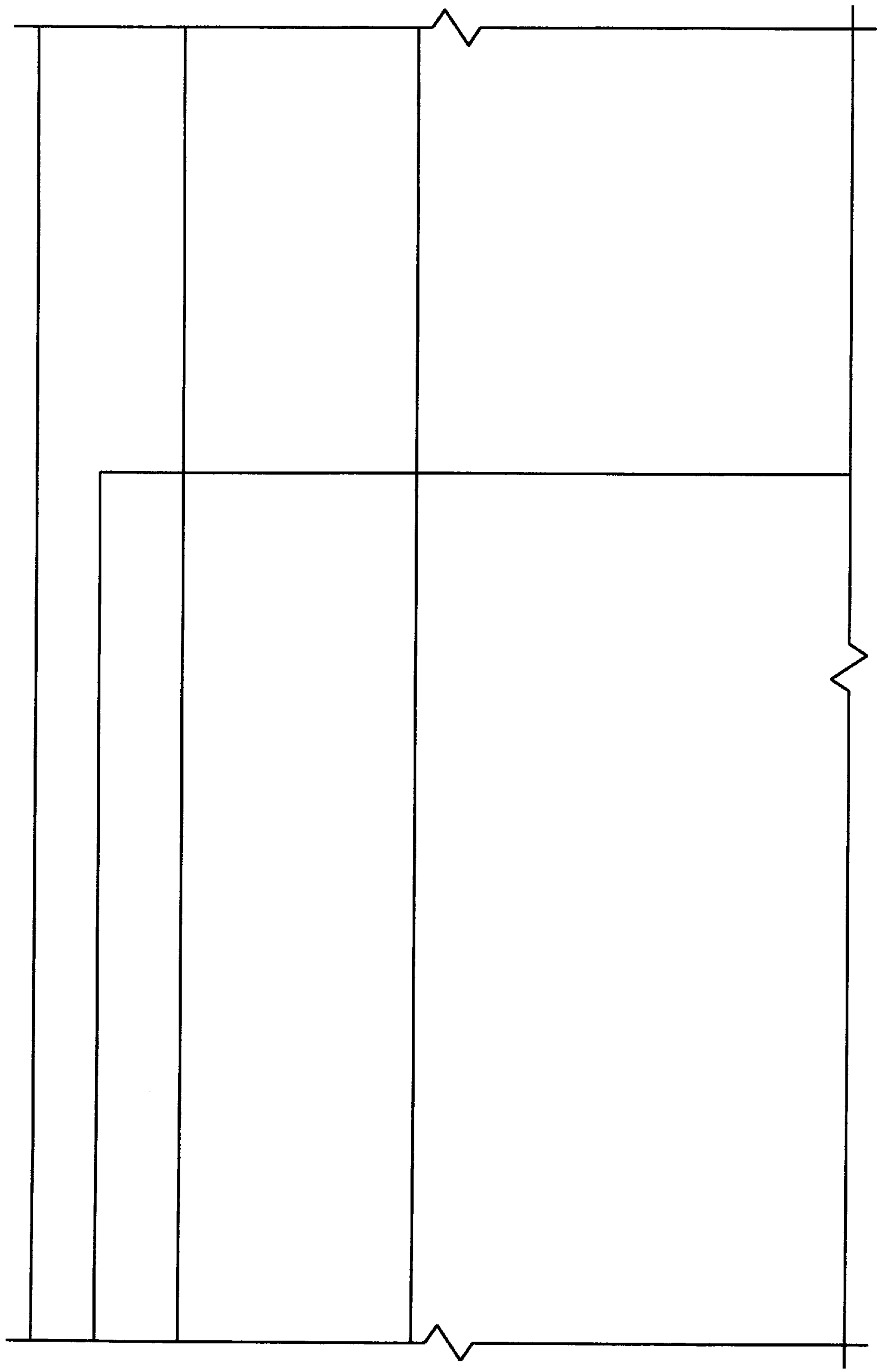
FIG. 8.0103AB

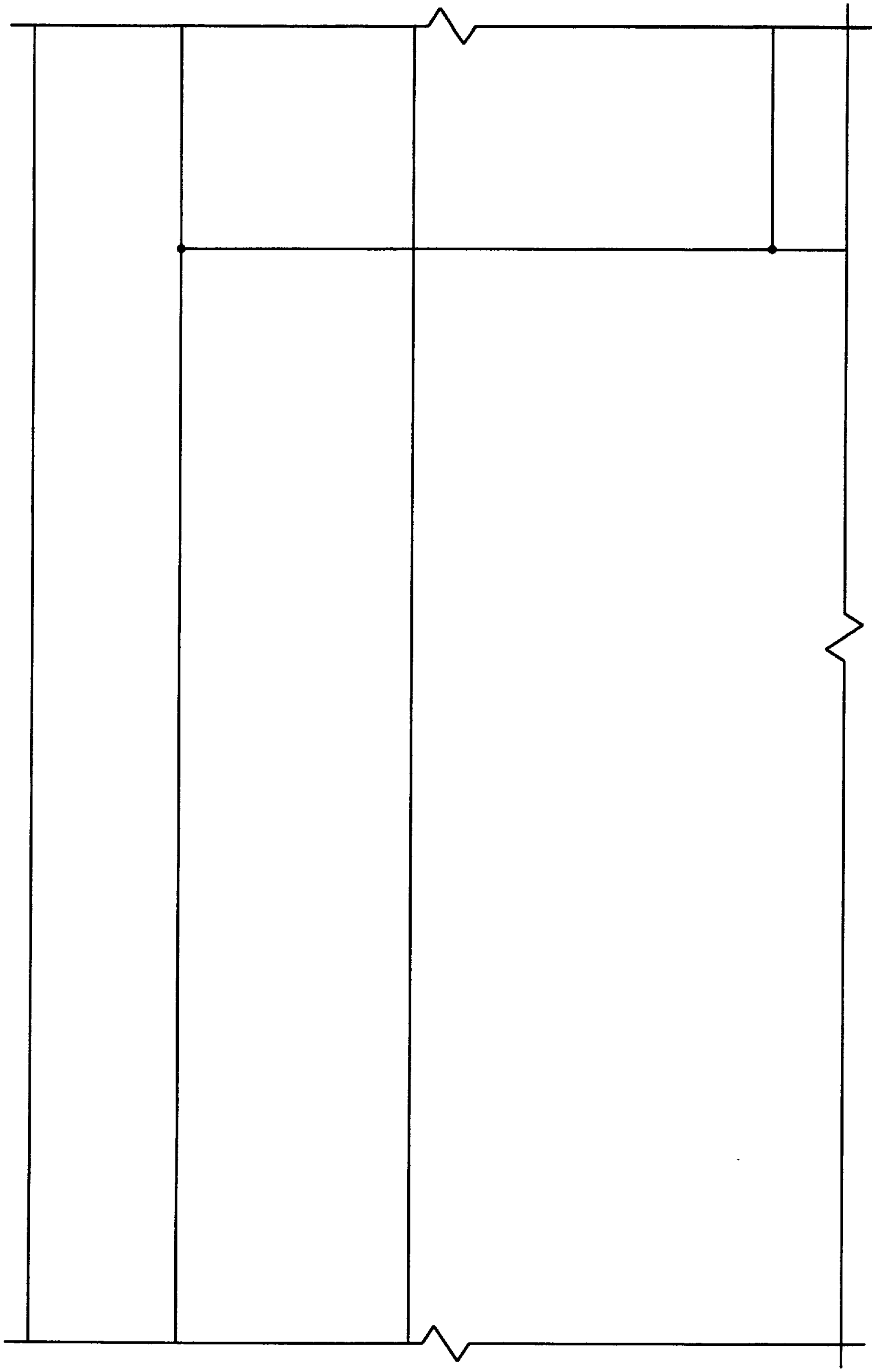
FIG. 8.010AAC

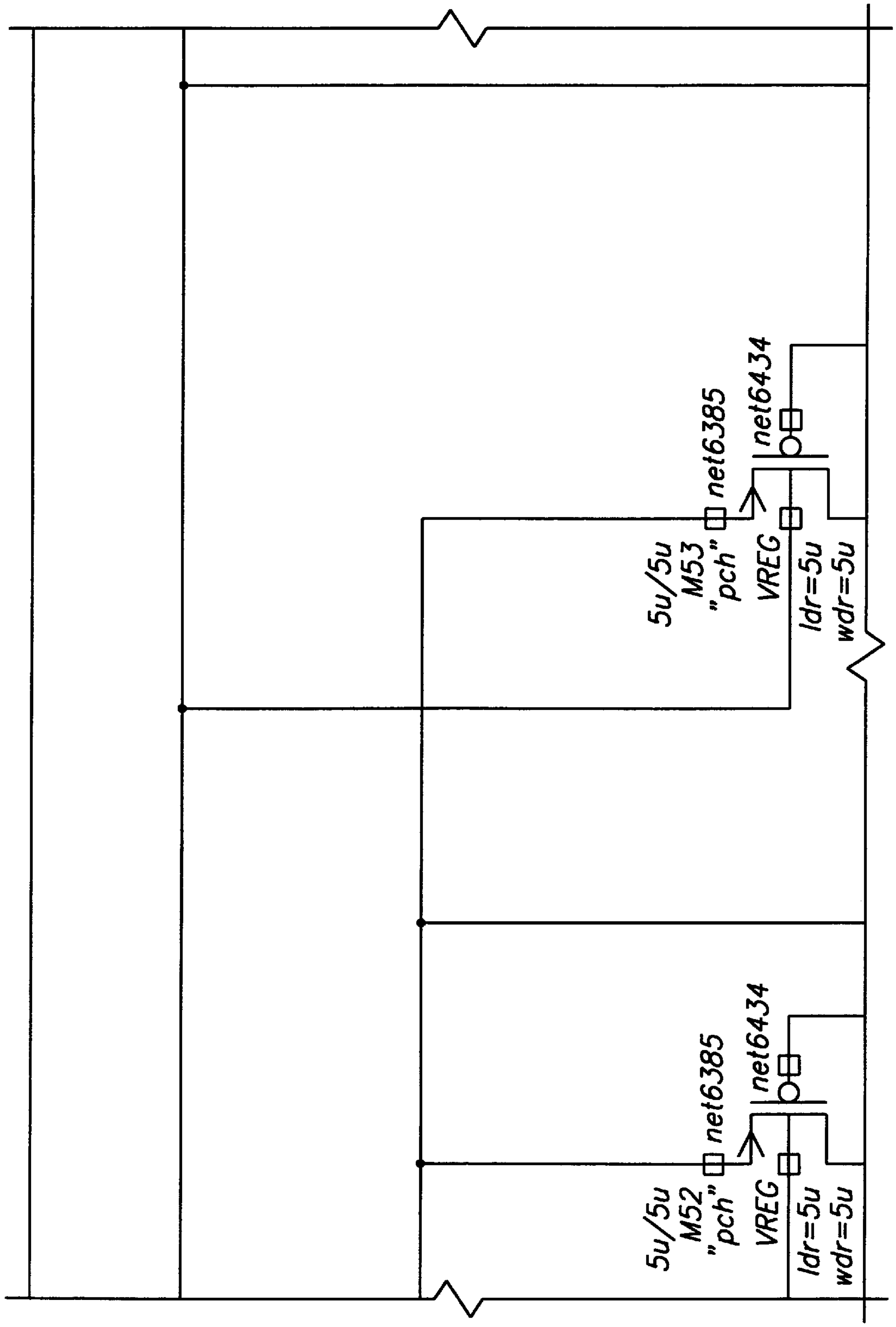
Fig. 8.010EAD

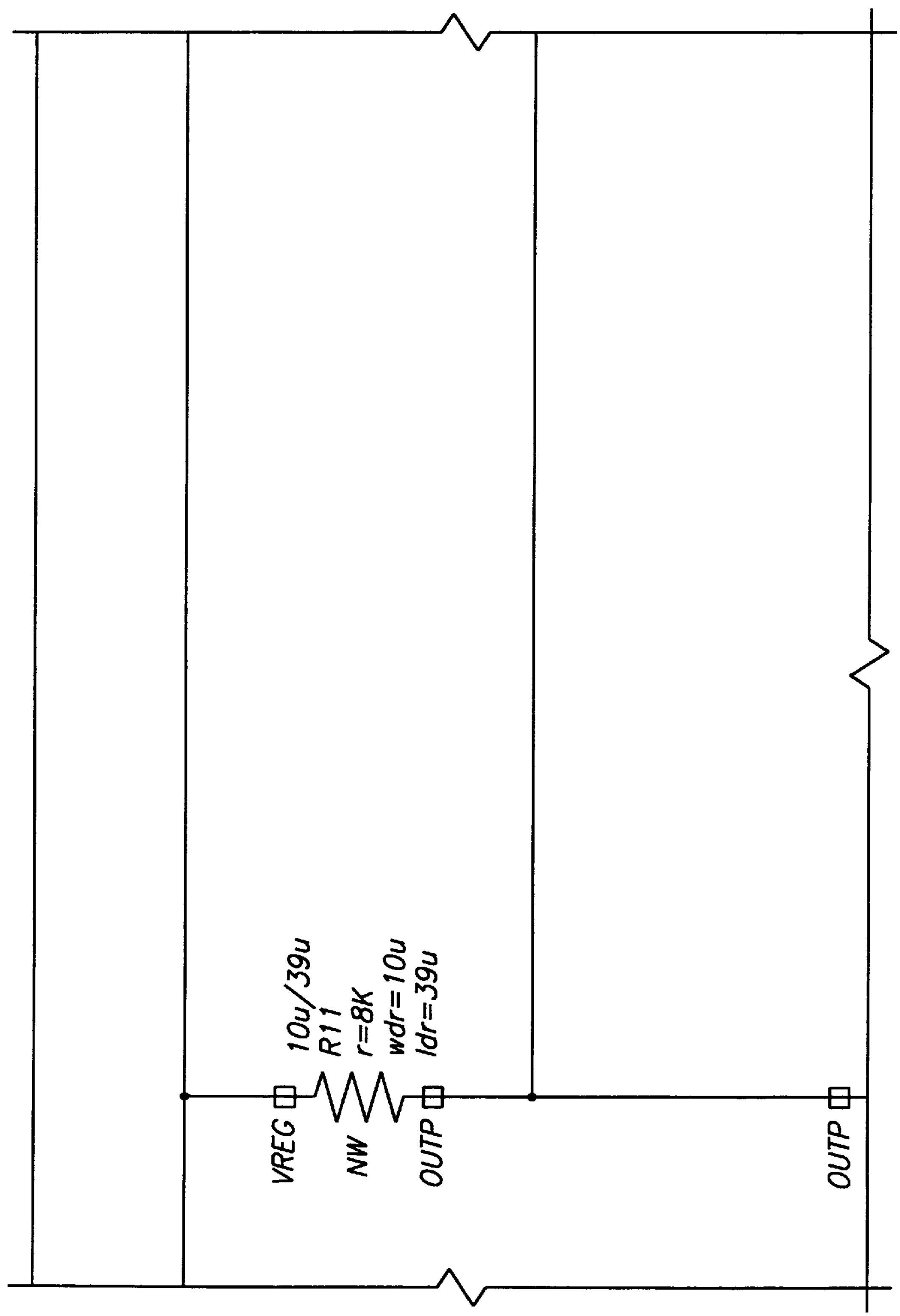
Fig. 8.010EAE

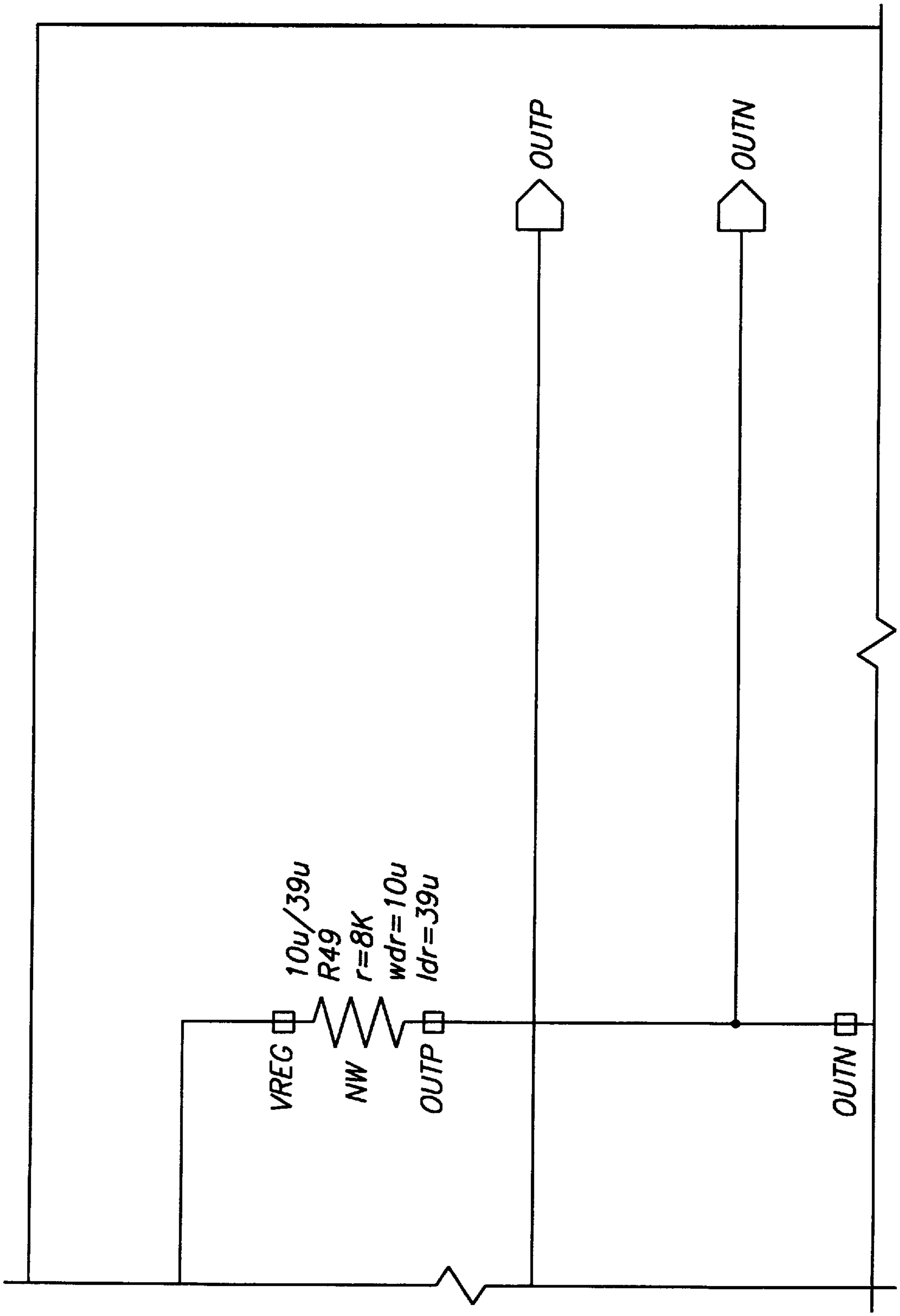
FIG. 8.010.EAE

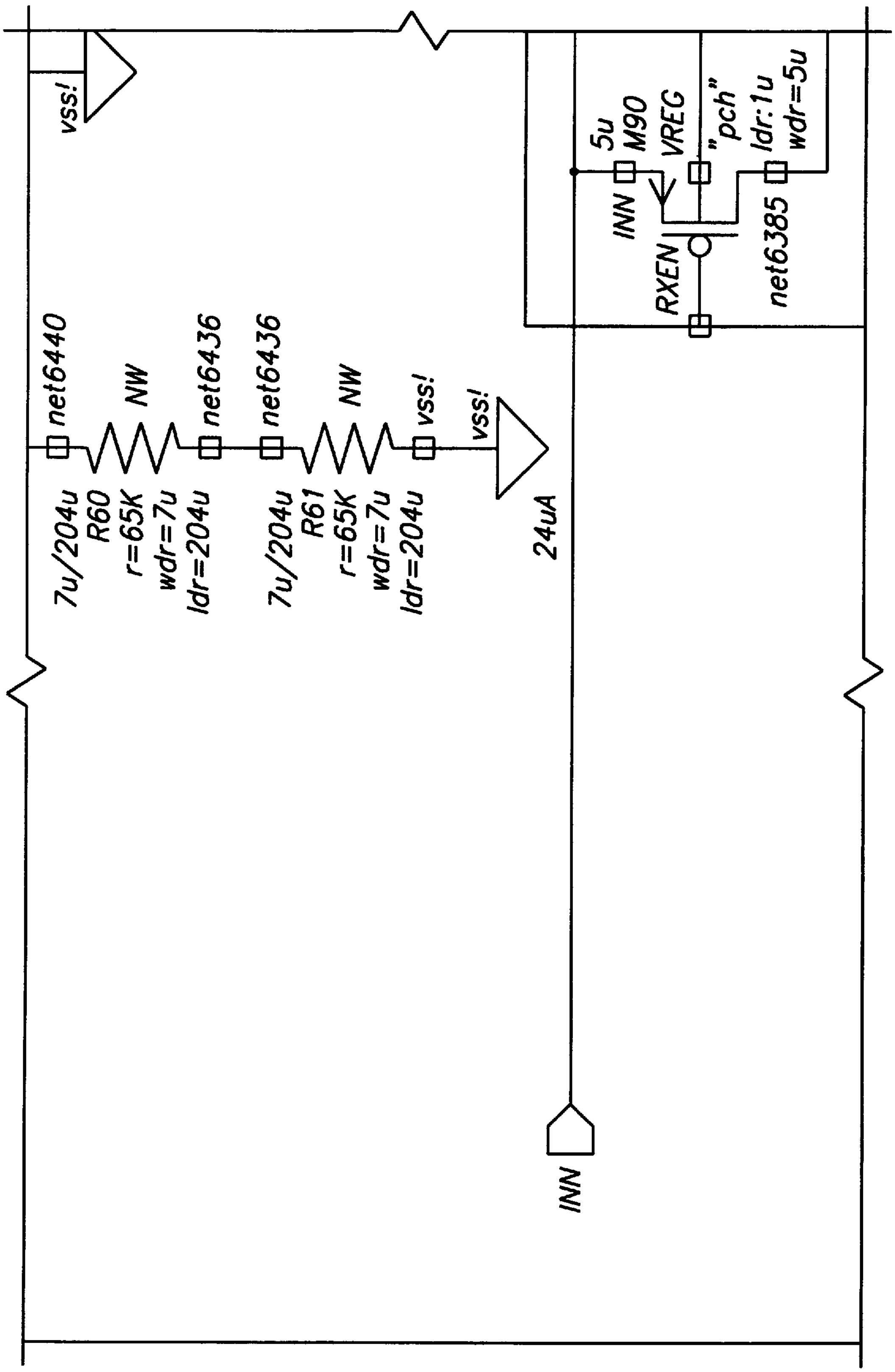
FIG. 8.010.38A

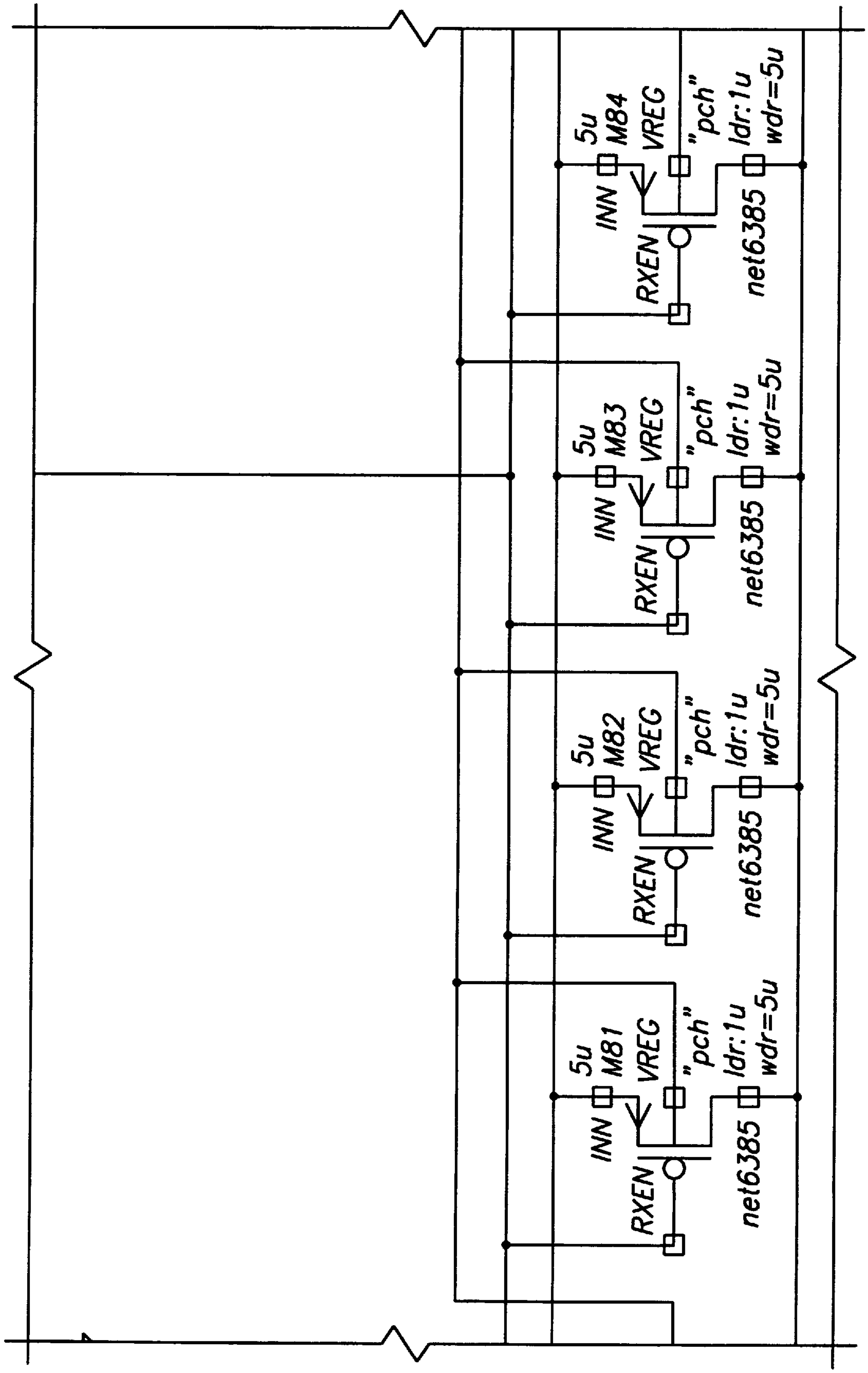
FIG. 8.01.03BB

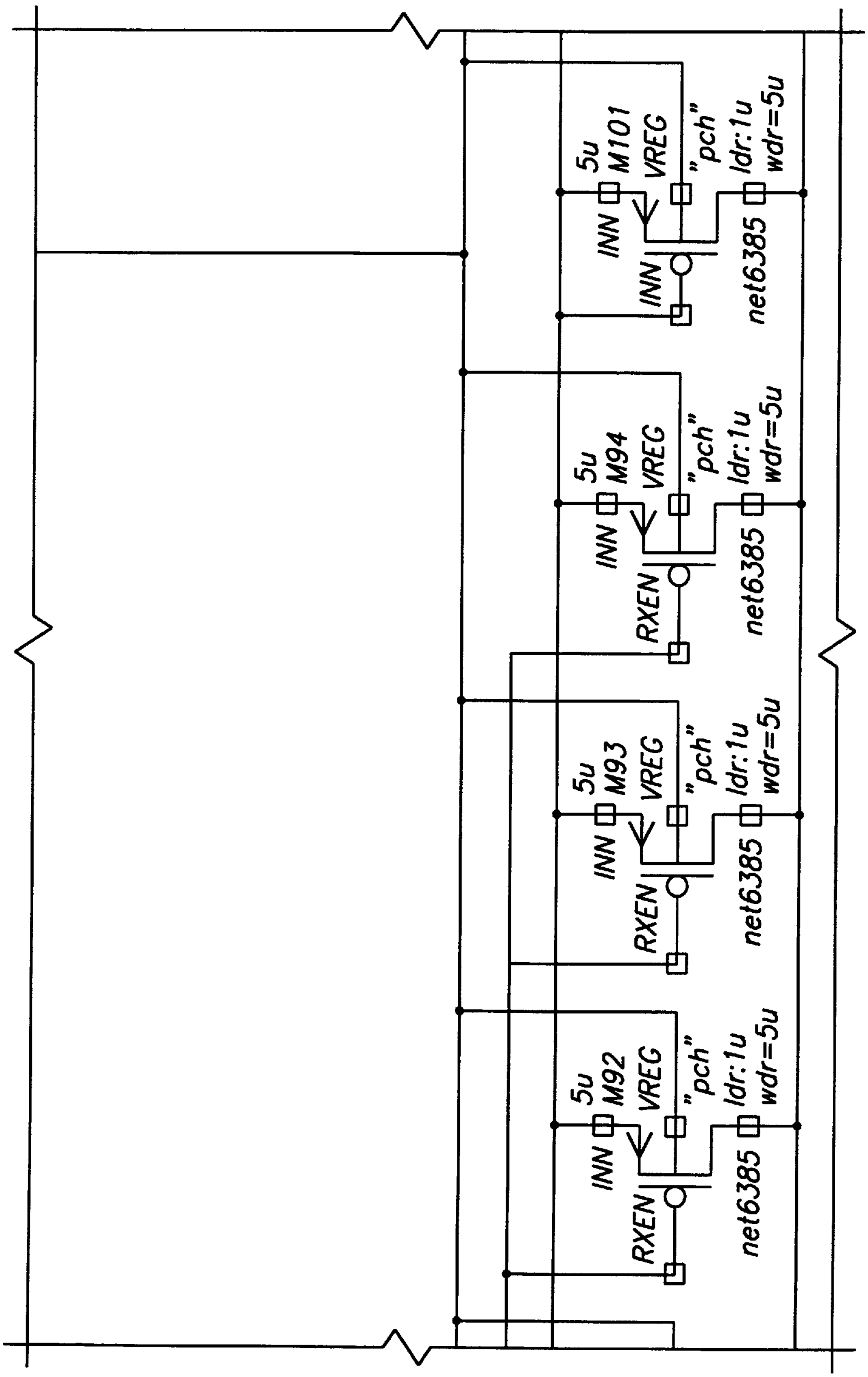
FIG. 8.010EBC

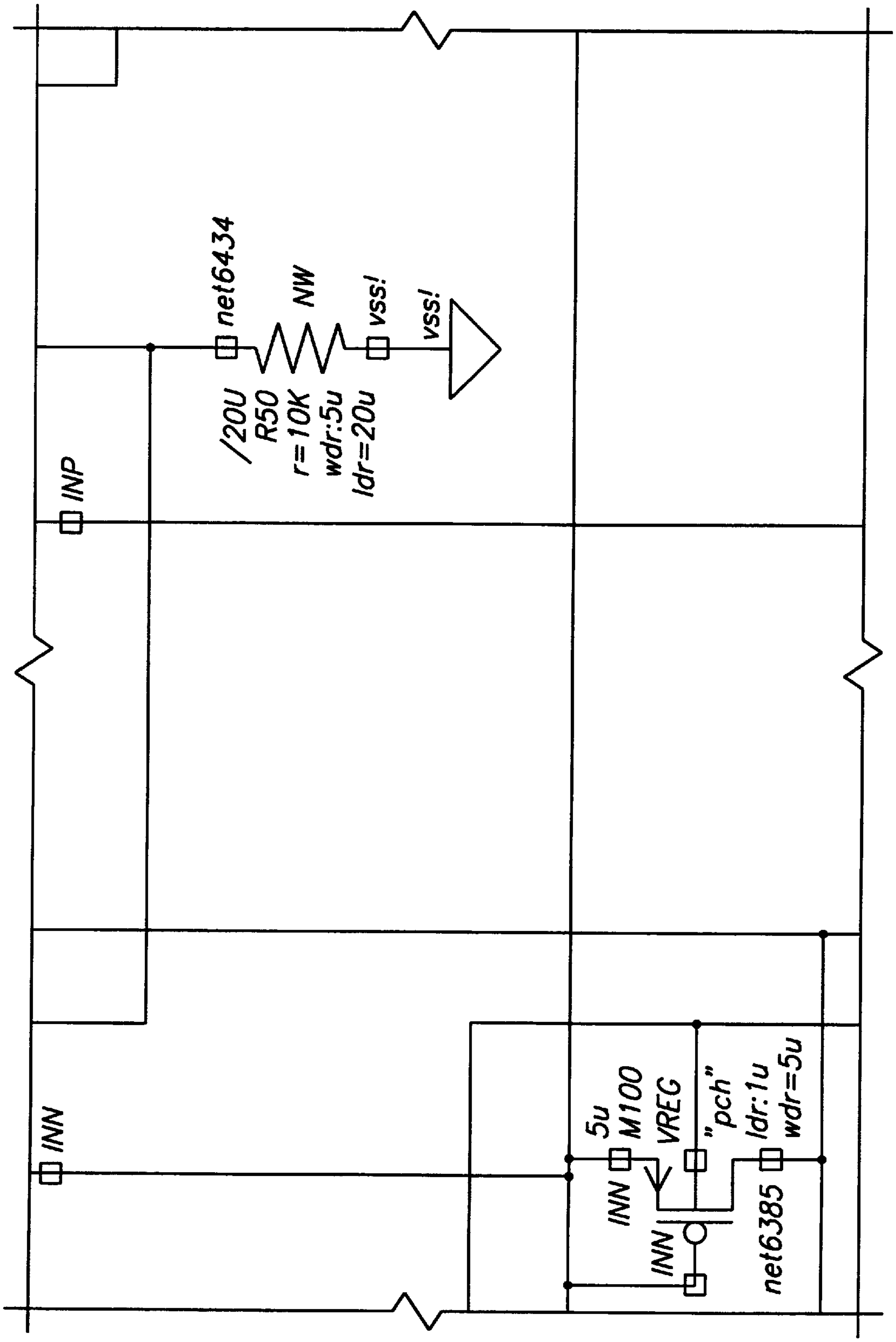
Fig. 8.10.3BD

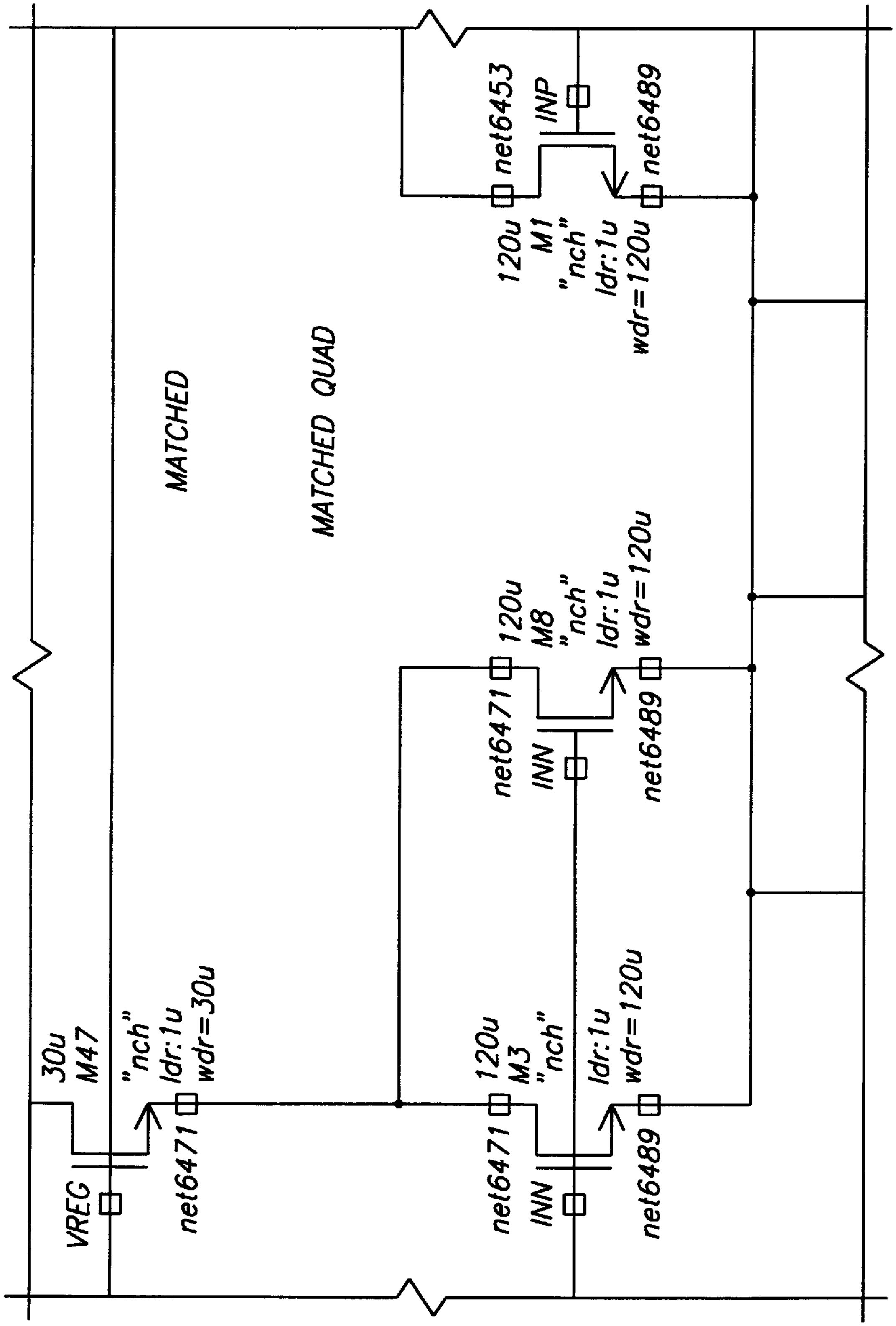
Fig. 8.0103BE

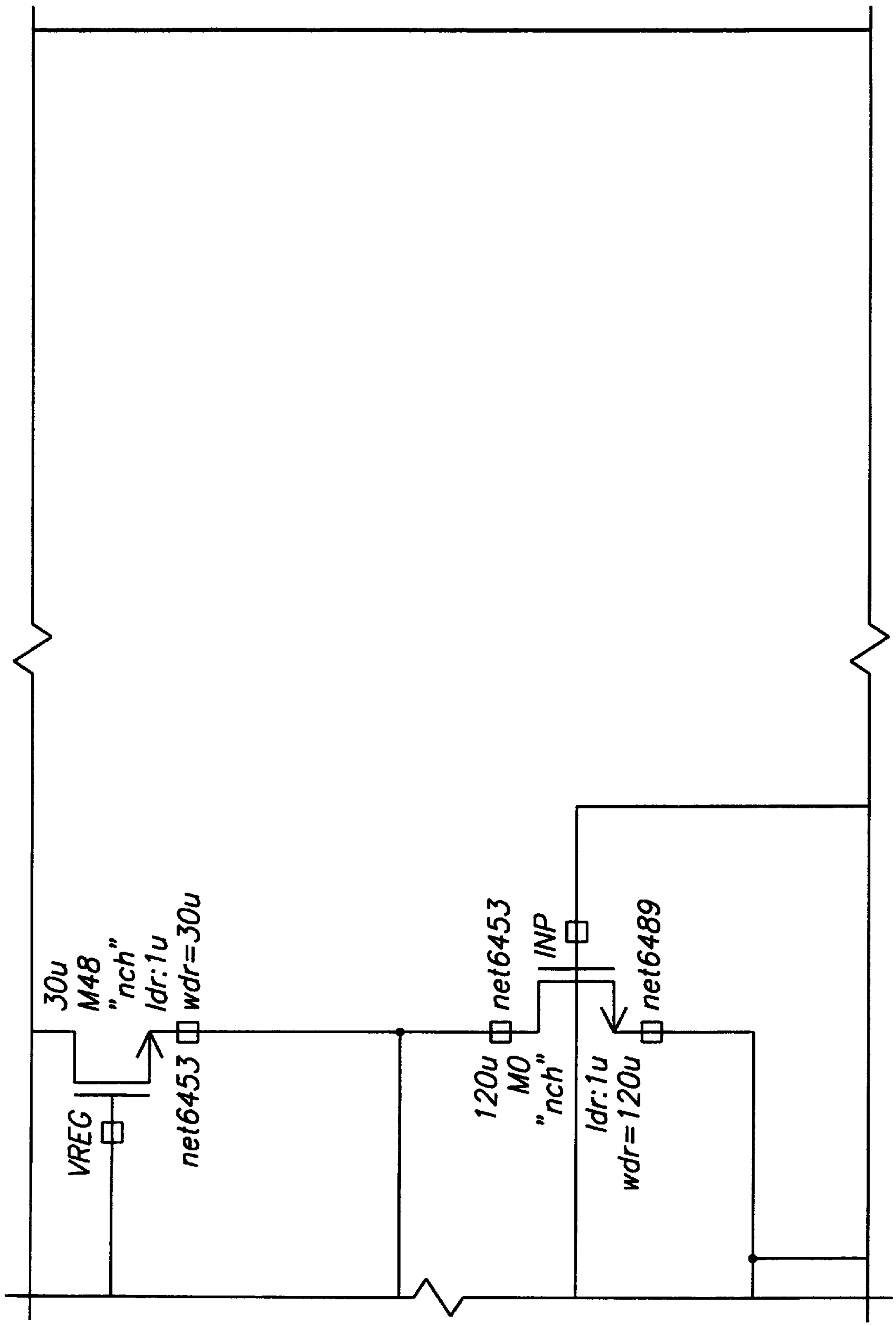
FIG. 8.0103BF

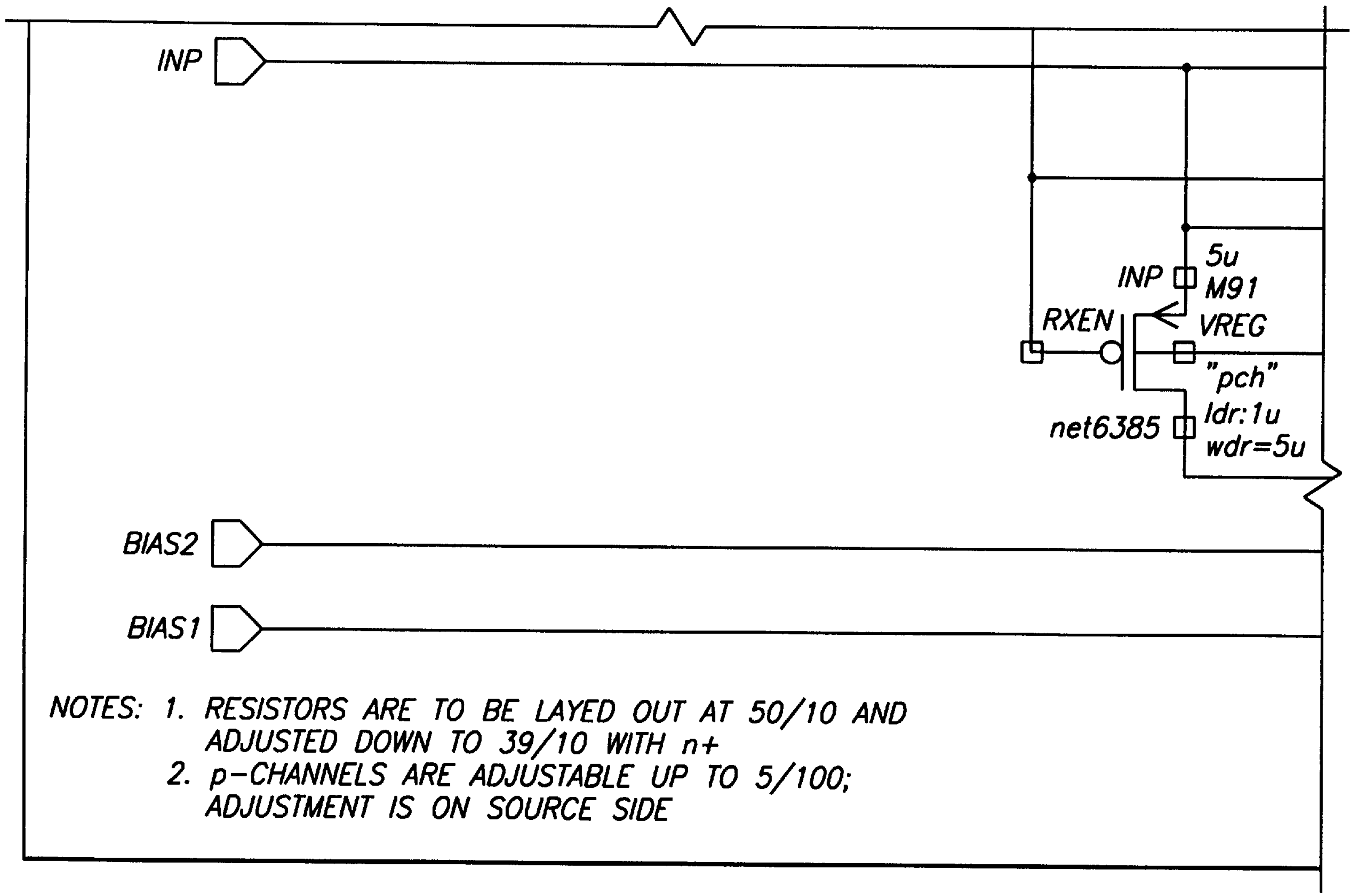
FIG. 8.0103CA

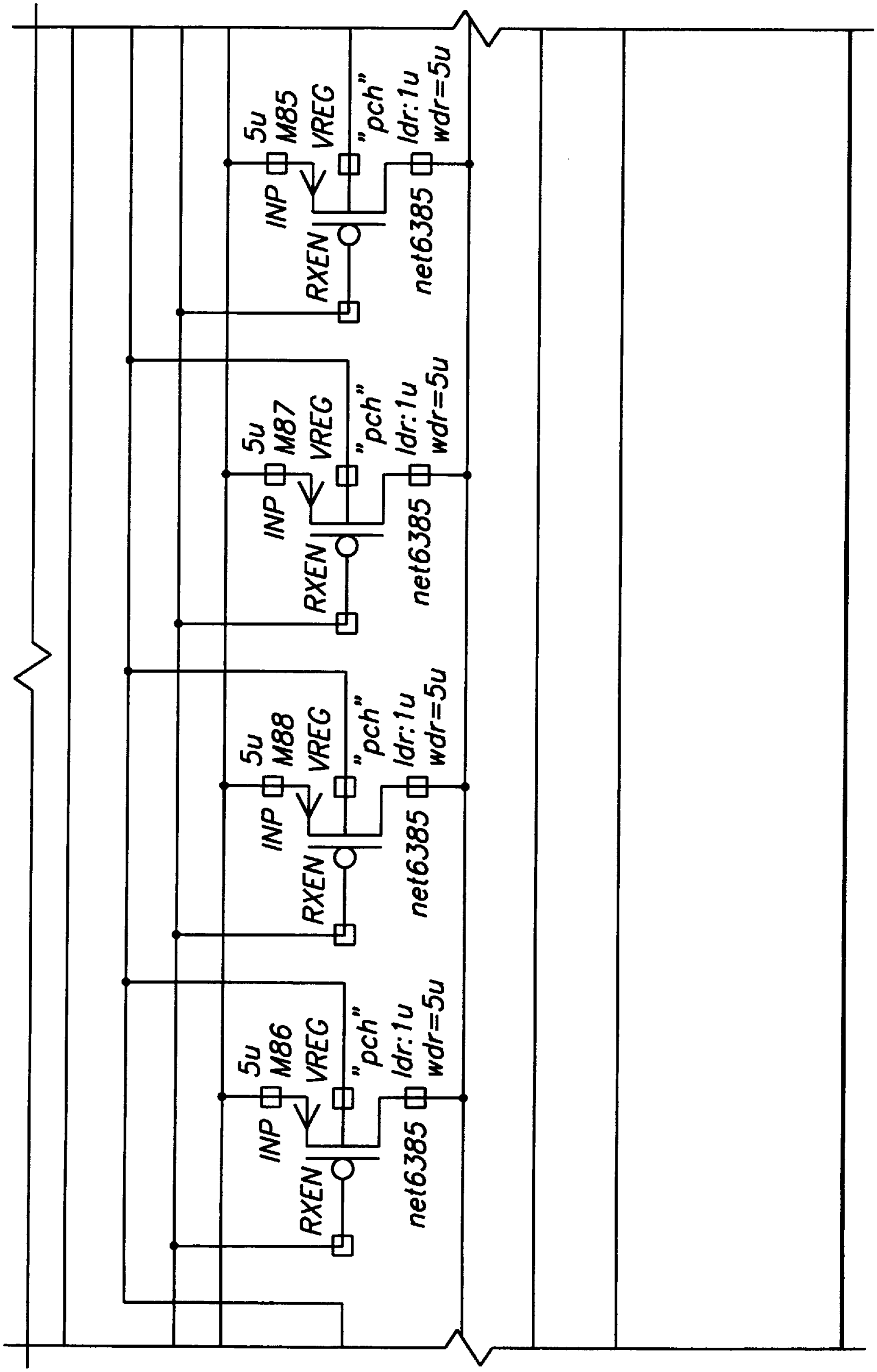
FIG. 8.0103CB

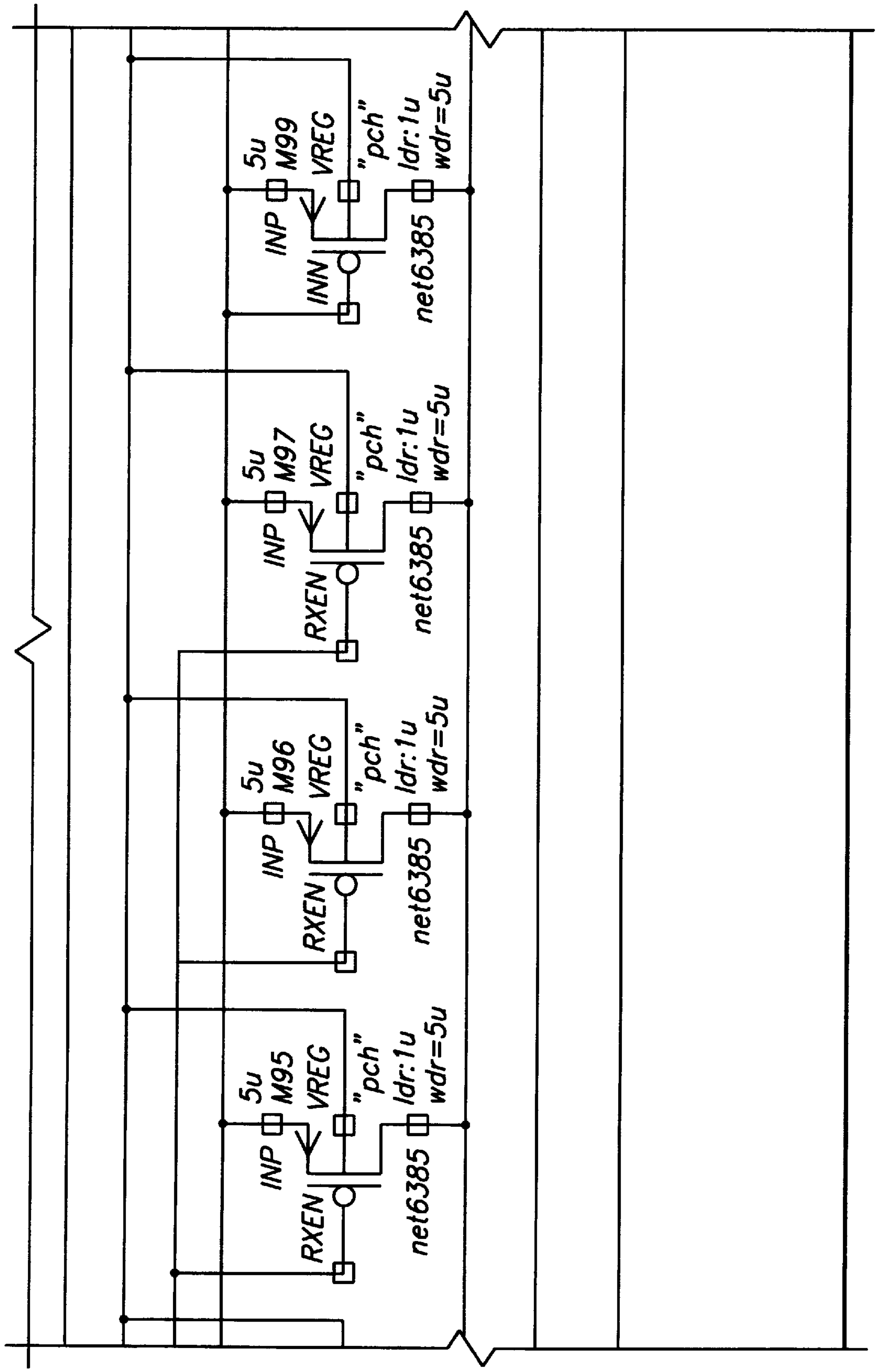
Fig. 8.010.3CC

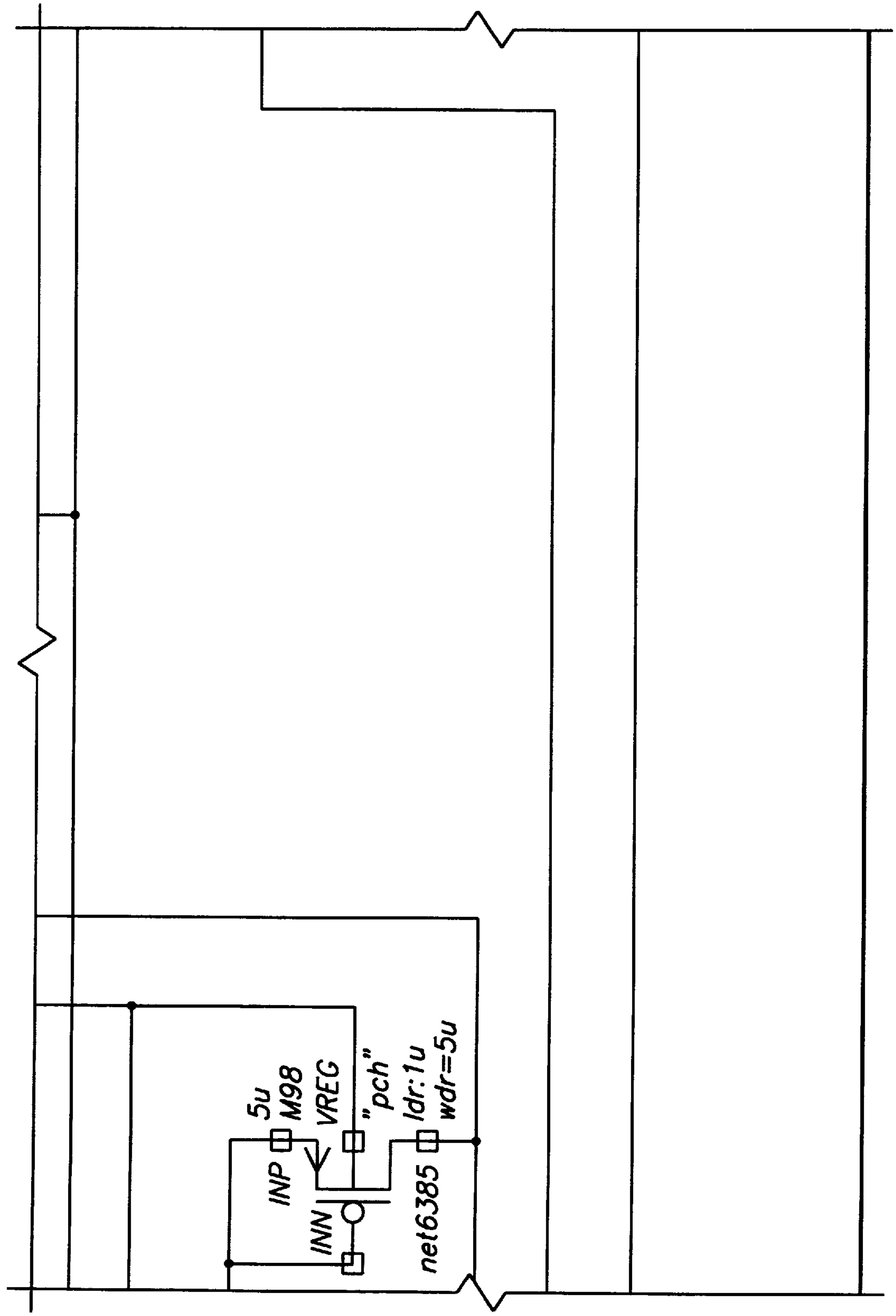
FIG. 8.0103B

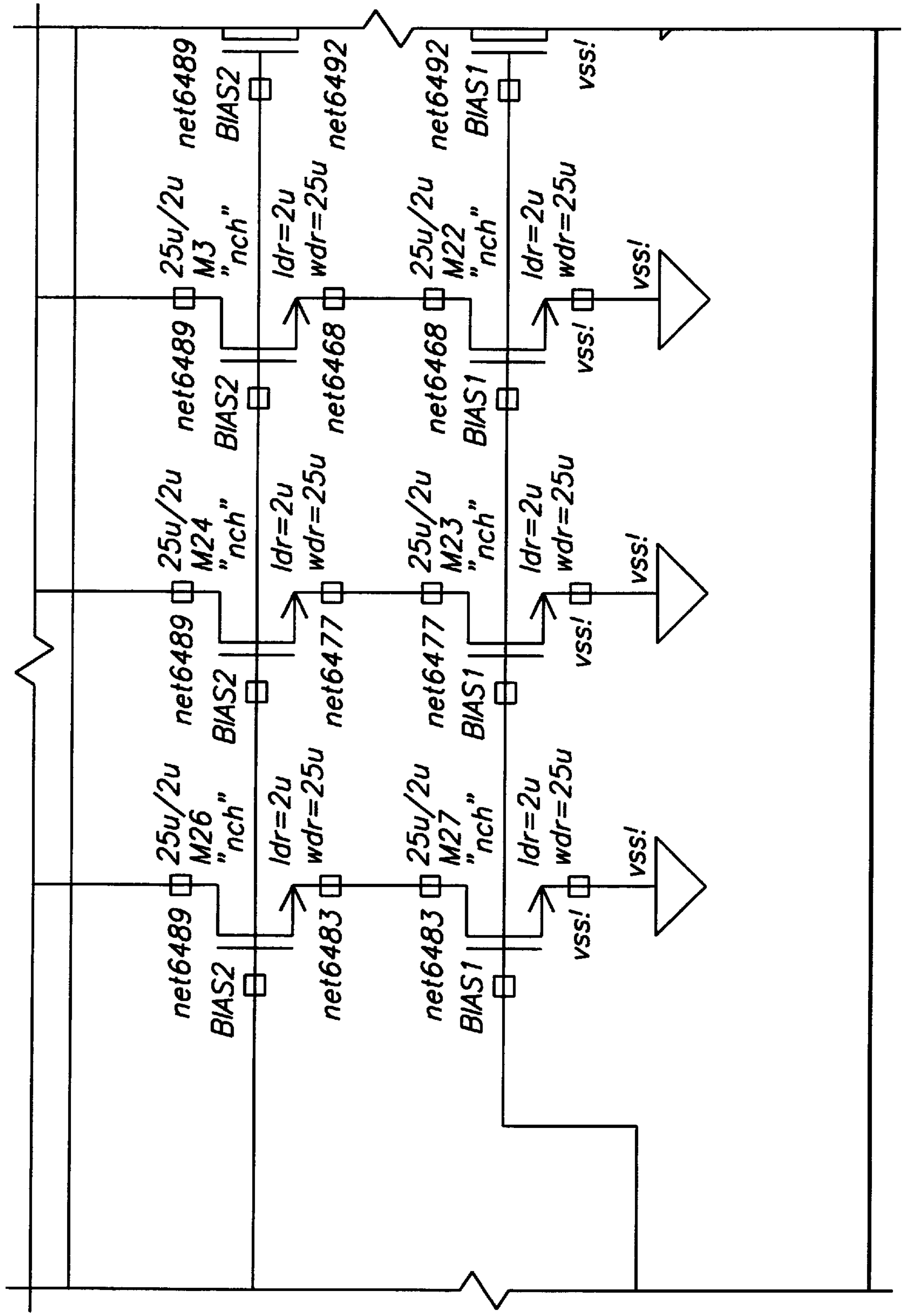
FIG. 8.010.3CE

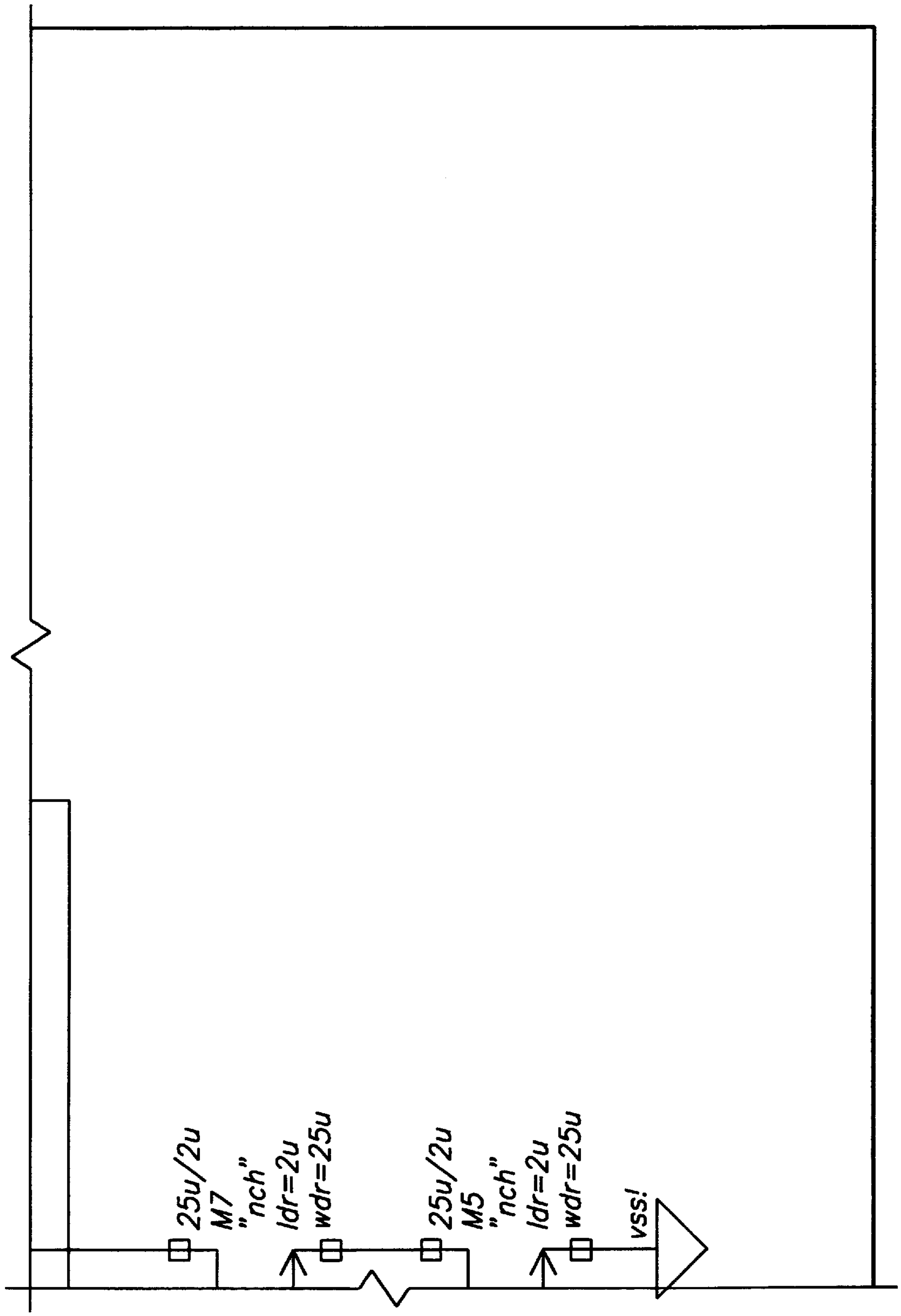
Fig. 8.0103CF

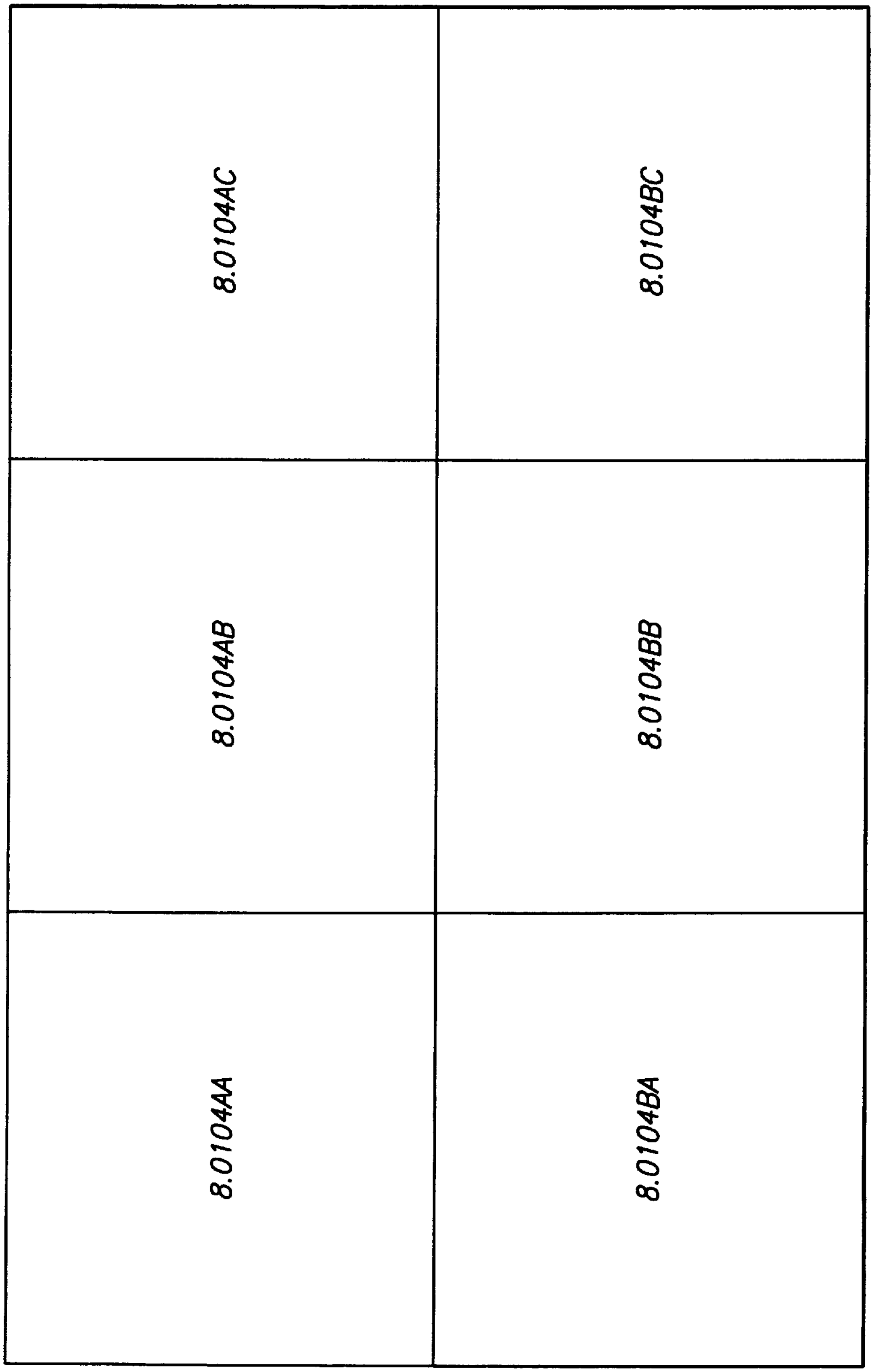
FIG. 8.0104B

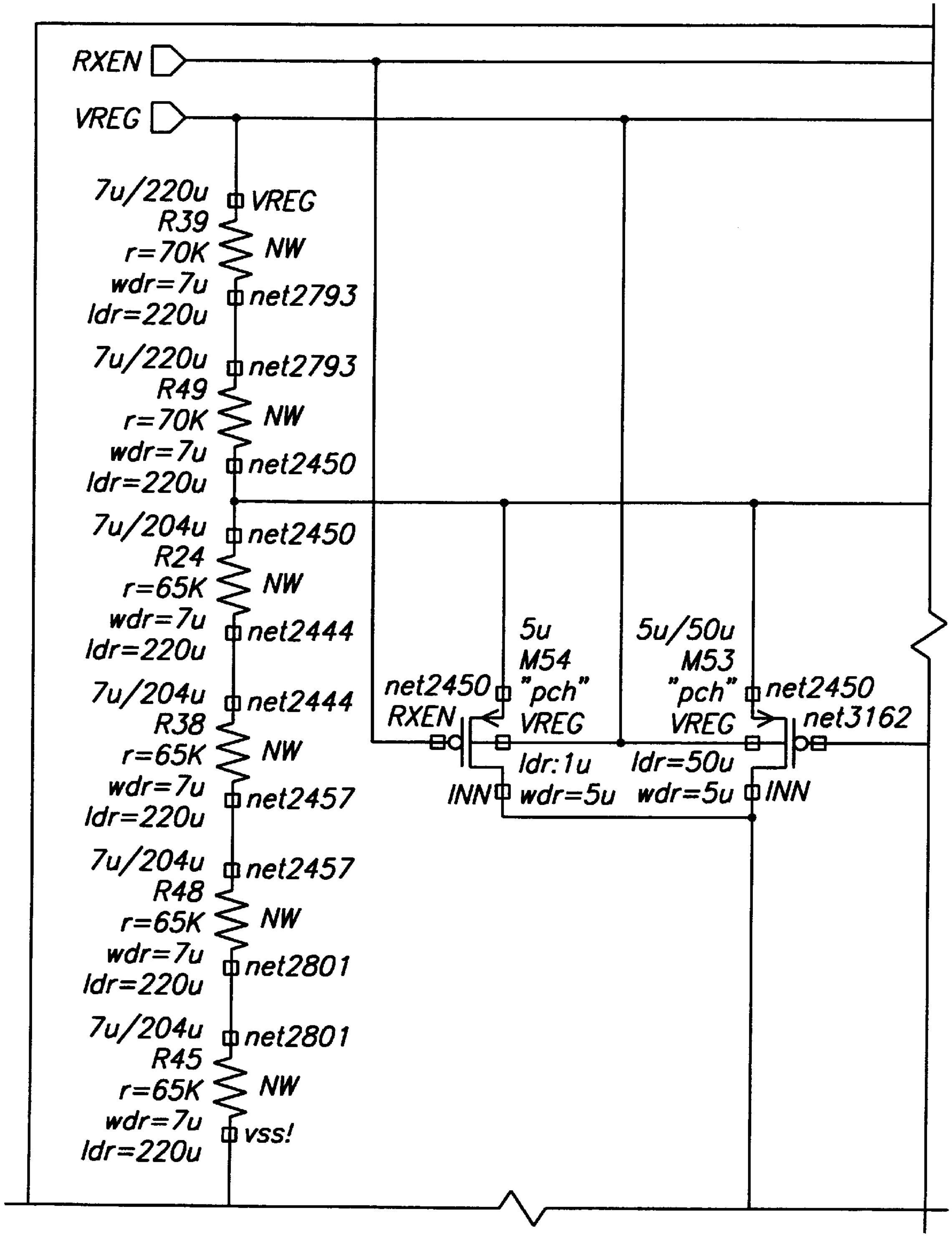
FIG. 8.0104AA

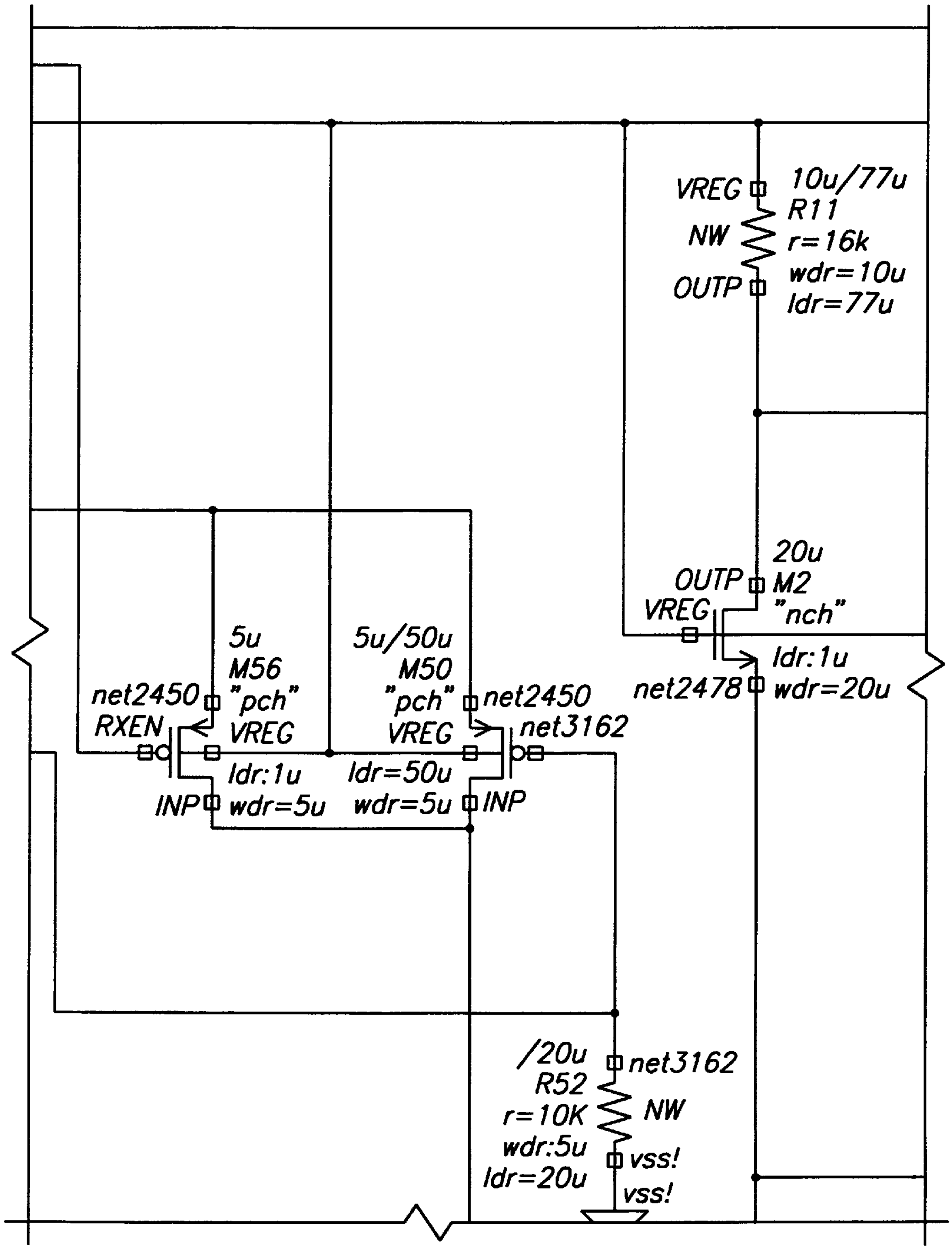
Fig 8.0104AB

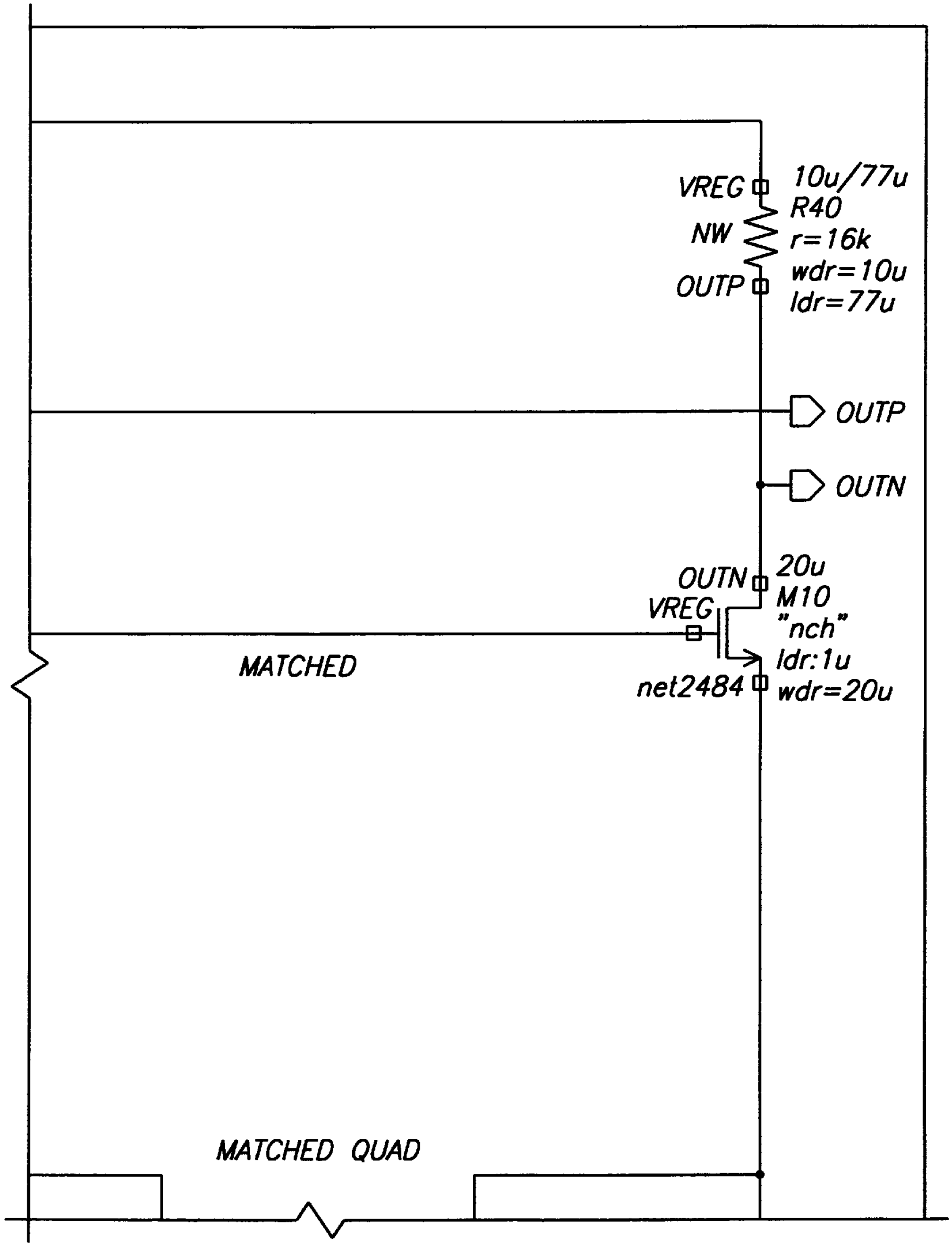
Fig 8.0104AC

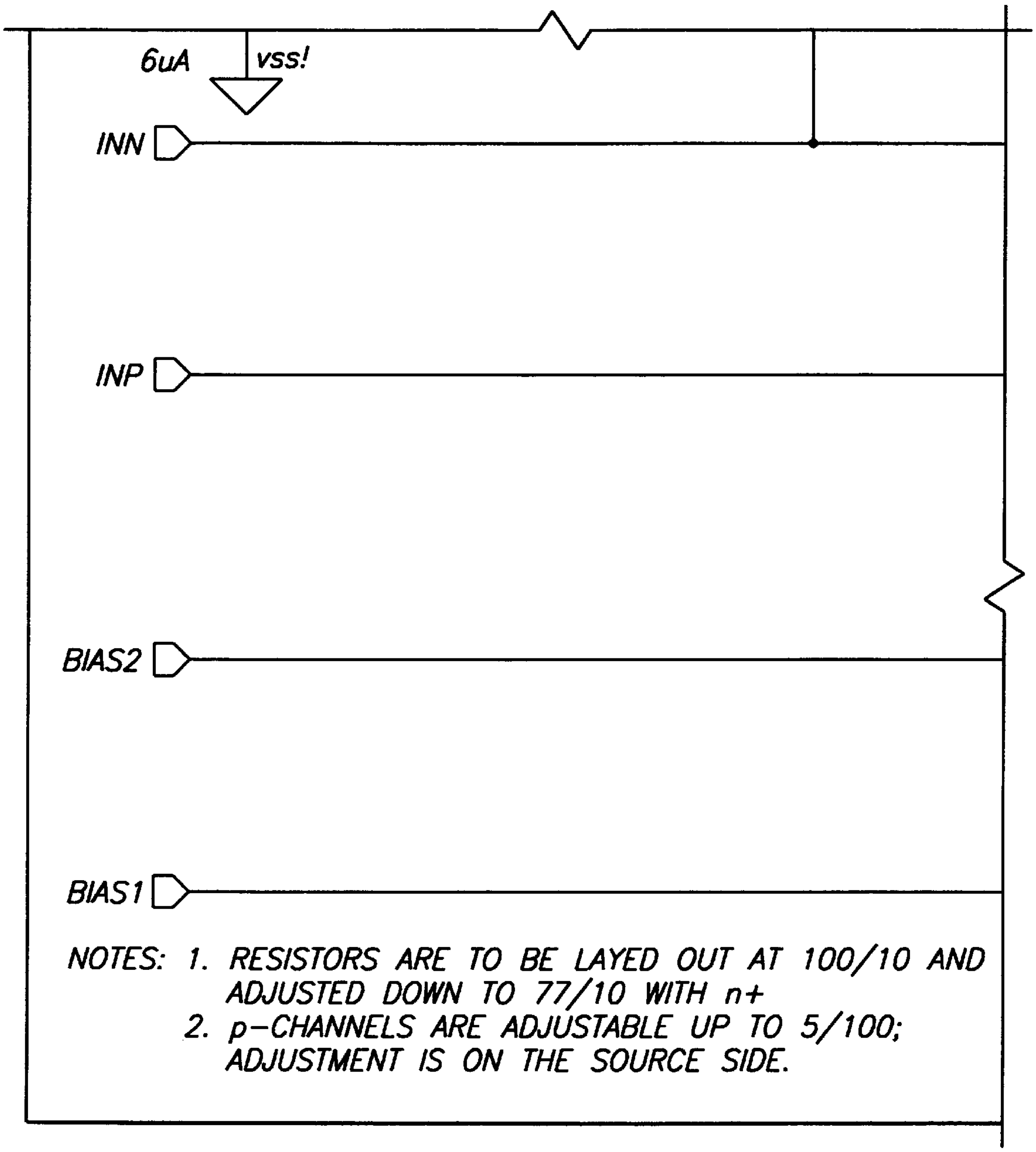
NOTES: 1. RESISTORS ARE TO BE LAYED OUT AT 100/10 AND ADJUSTED DOWN TO 77/10 WITH n+
2. p-CHANNELS ARE ADJUSTABLE UP TO 5/100; ADJUSTMENT IS ON THE SOURCE SIDE.
Fig 8.010.4BA

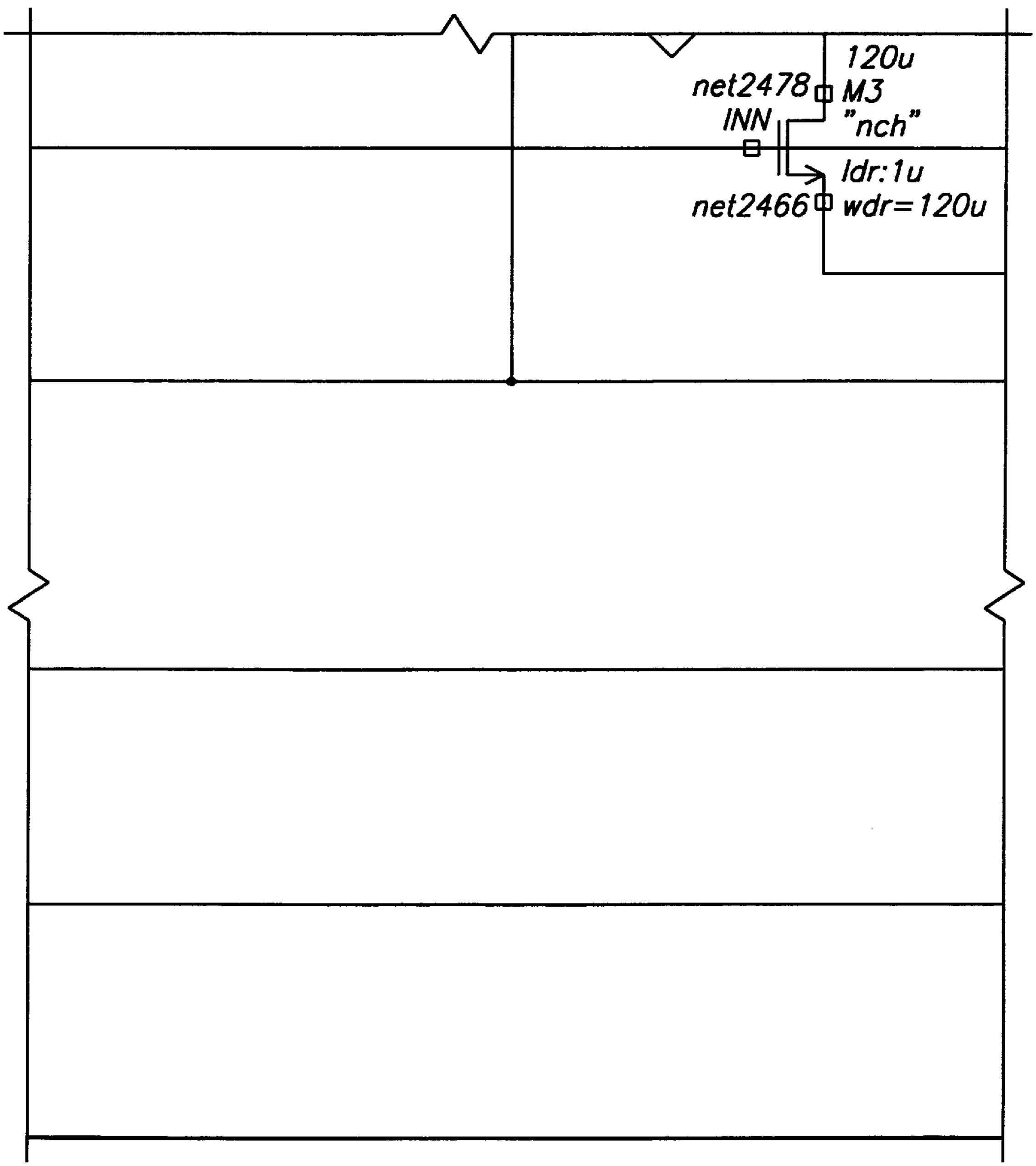
FIG. 8.0104BB

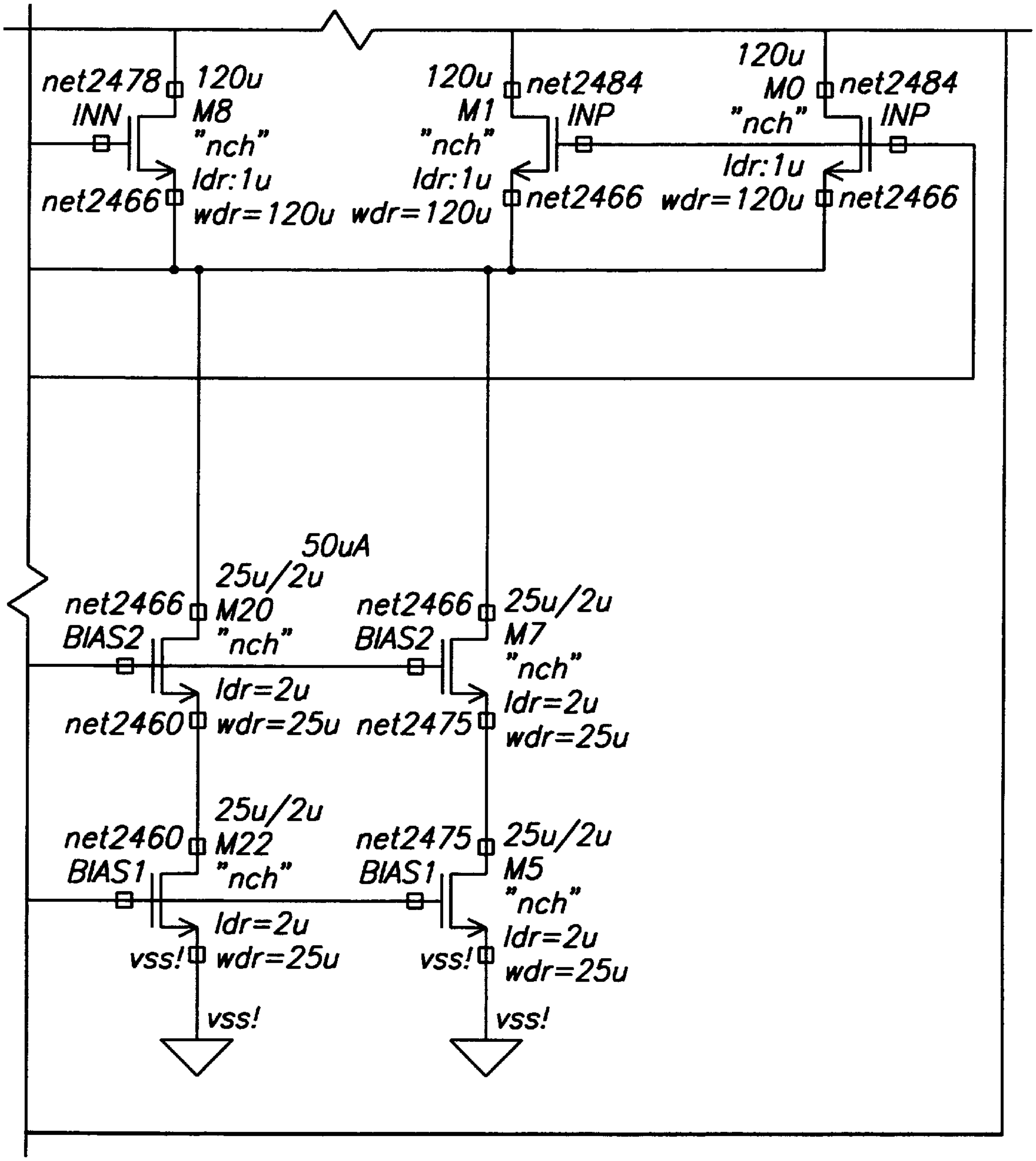
Fig 8.0104BC

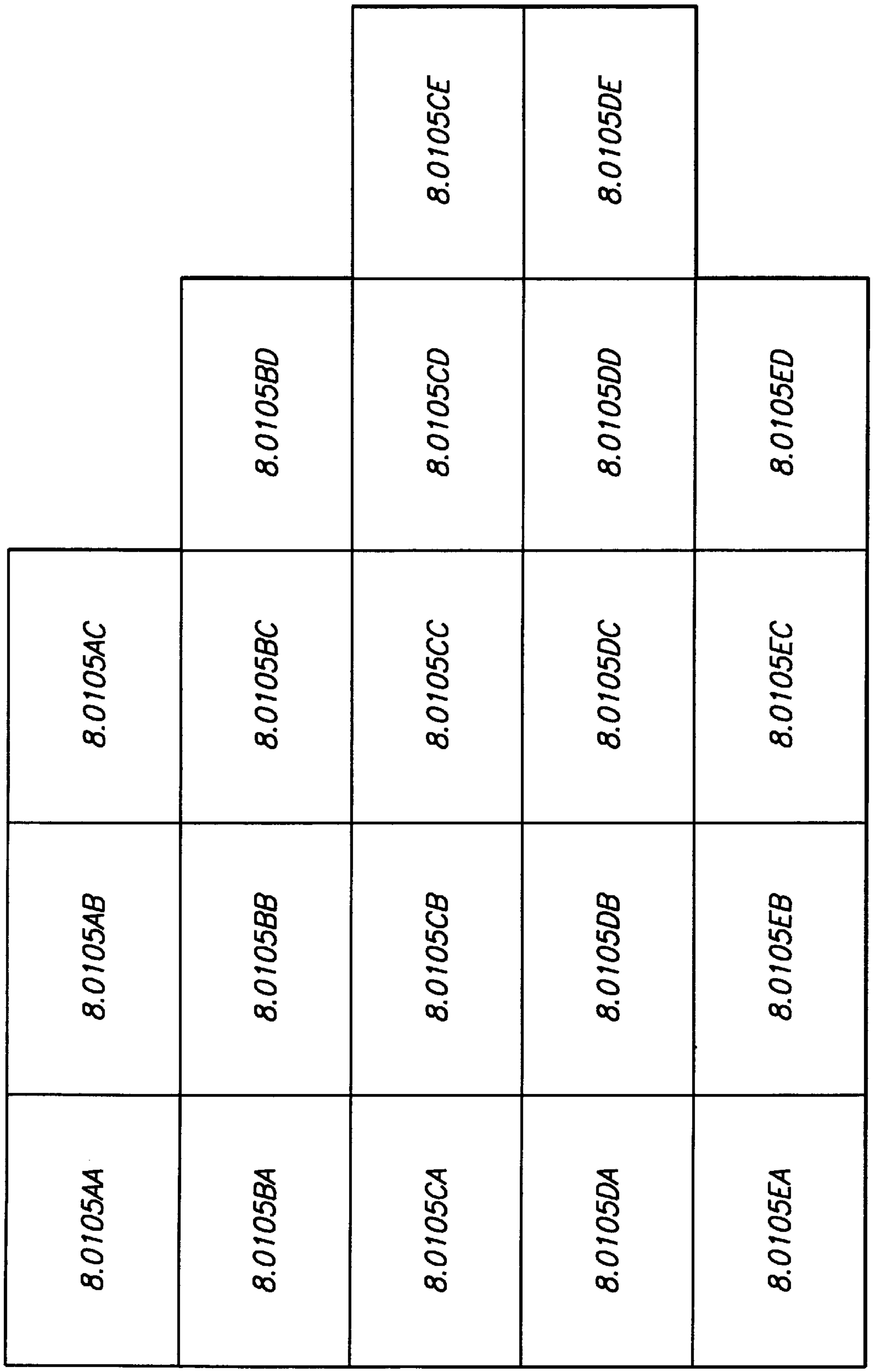
Fig 8.0105

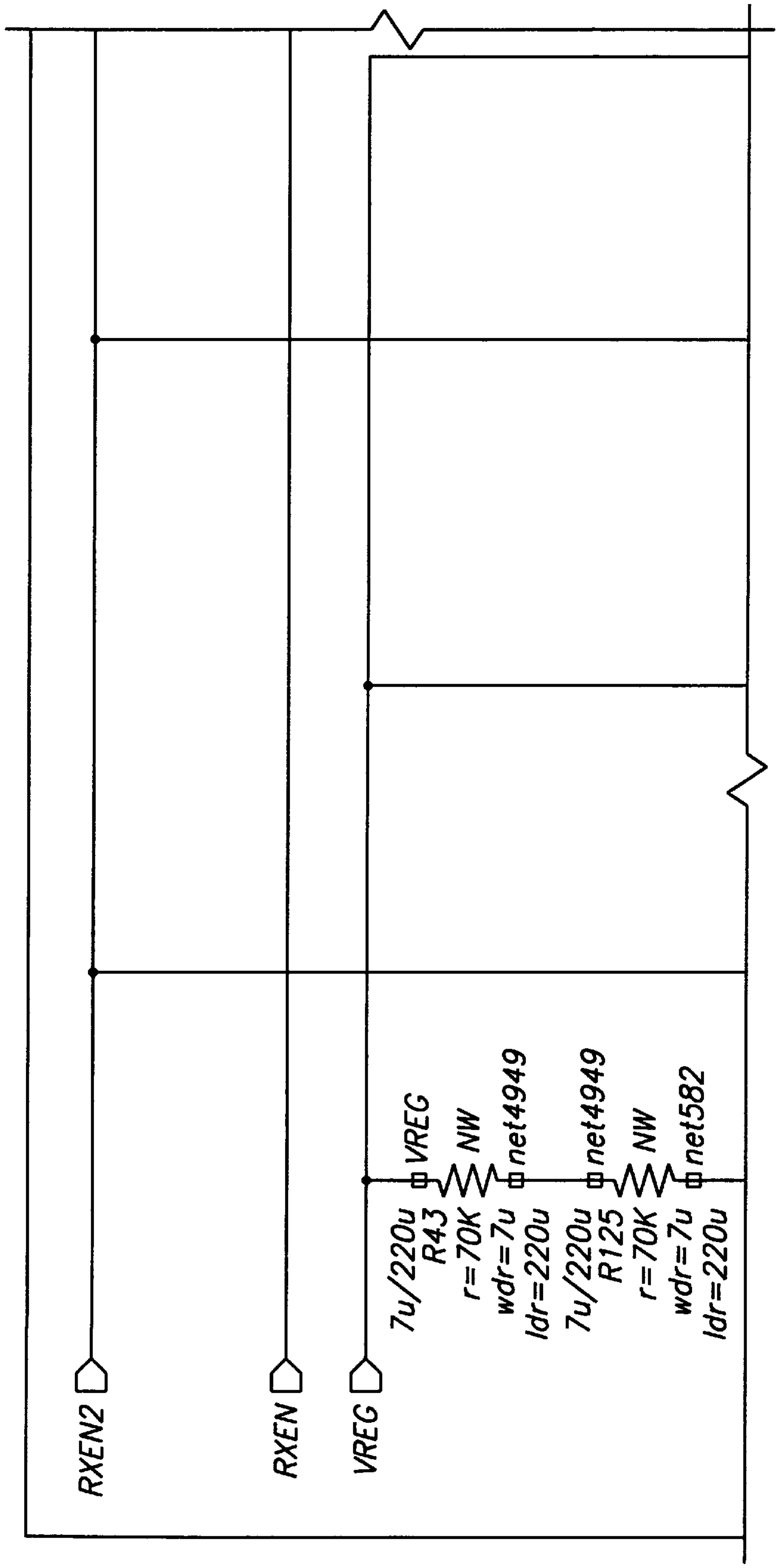
FIG. 8.0105AA

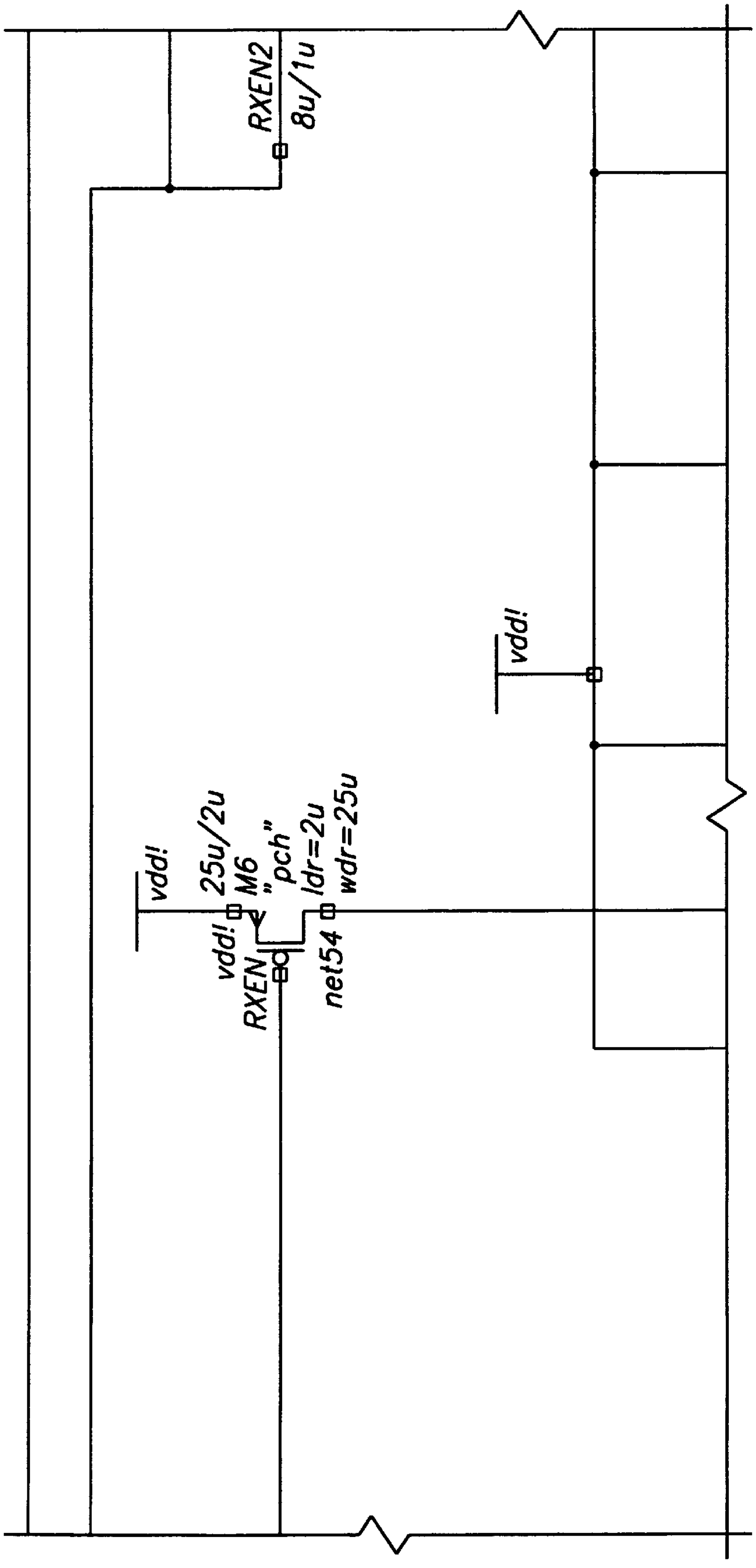
FIG. 8.010SAB

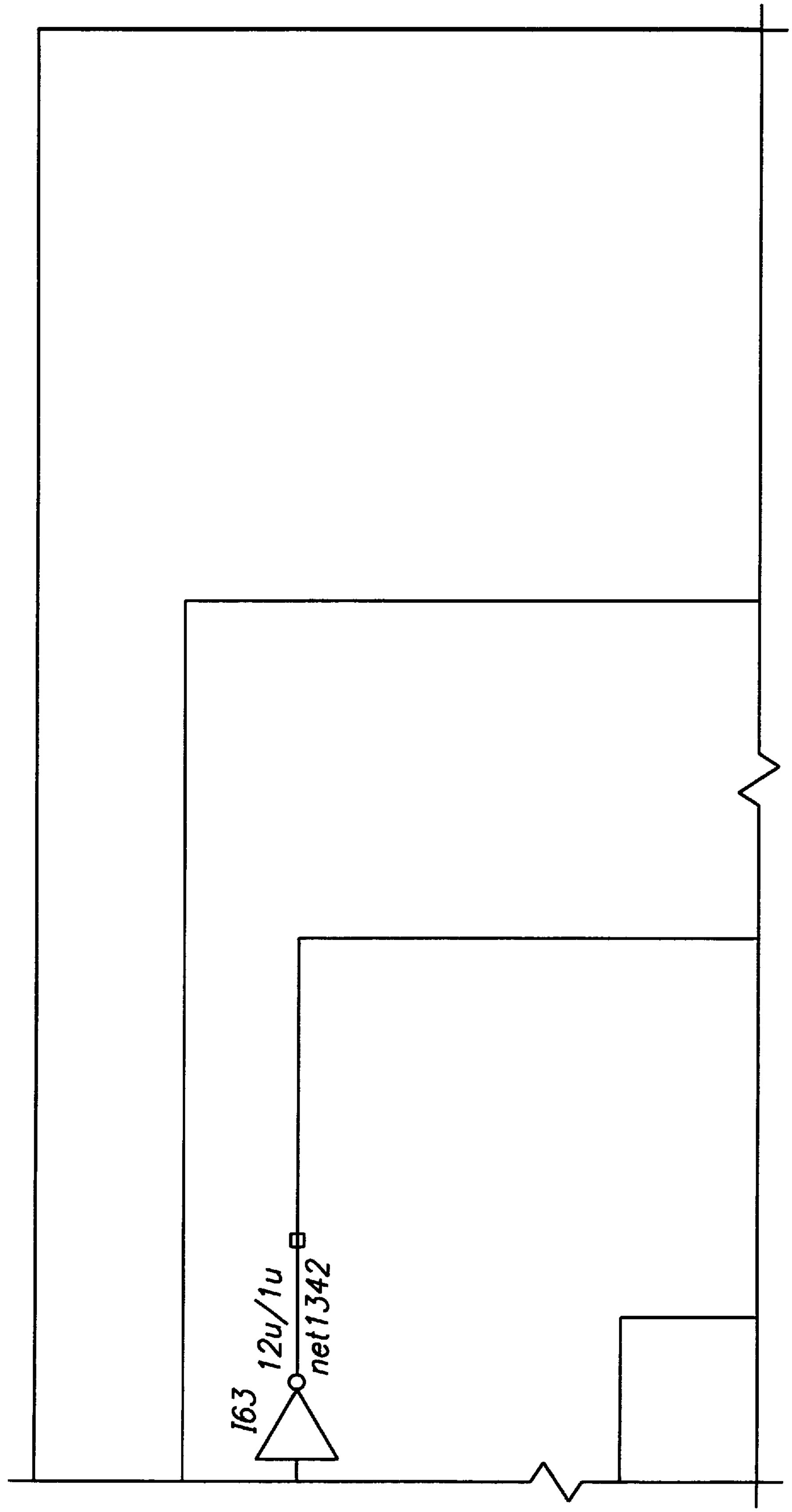
Fig. 8.0105AC

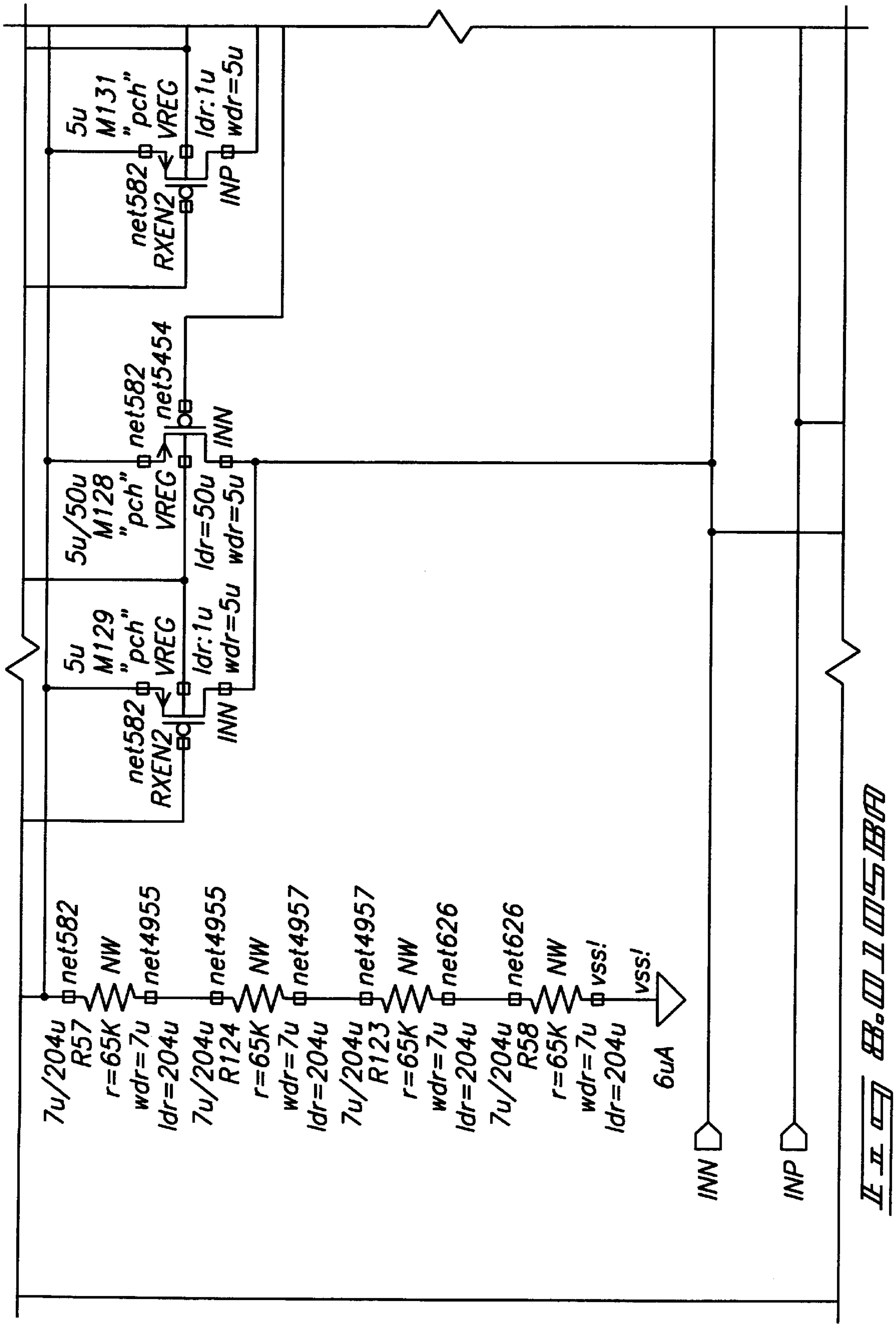
FIG. 8.0105BA

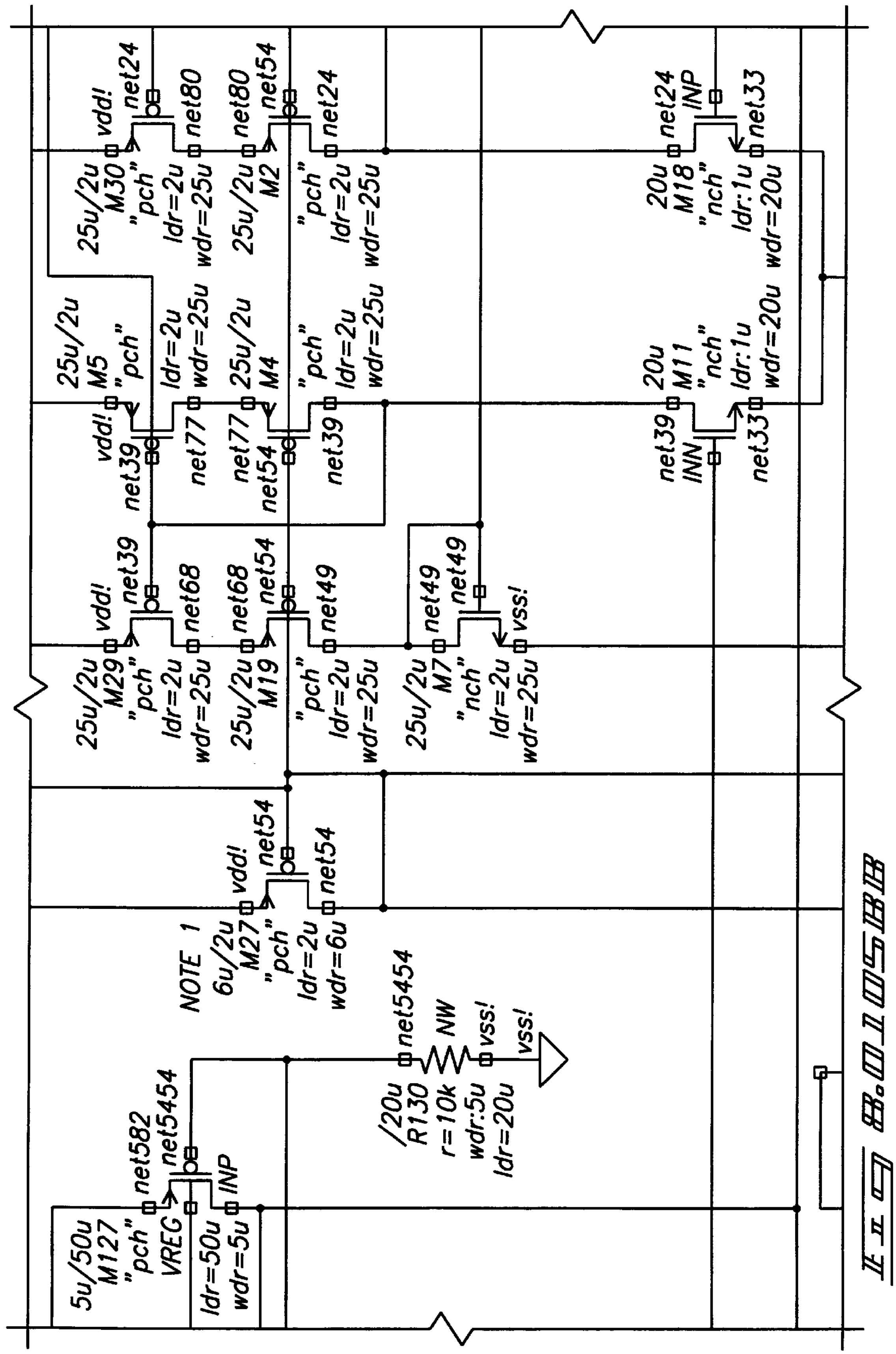
FIG. 8.0105BB

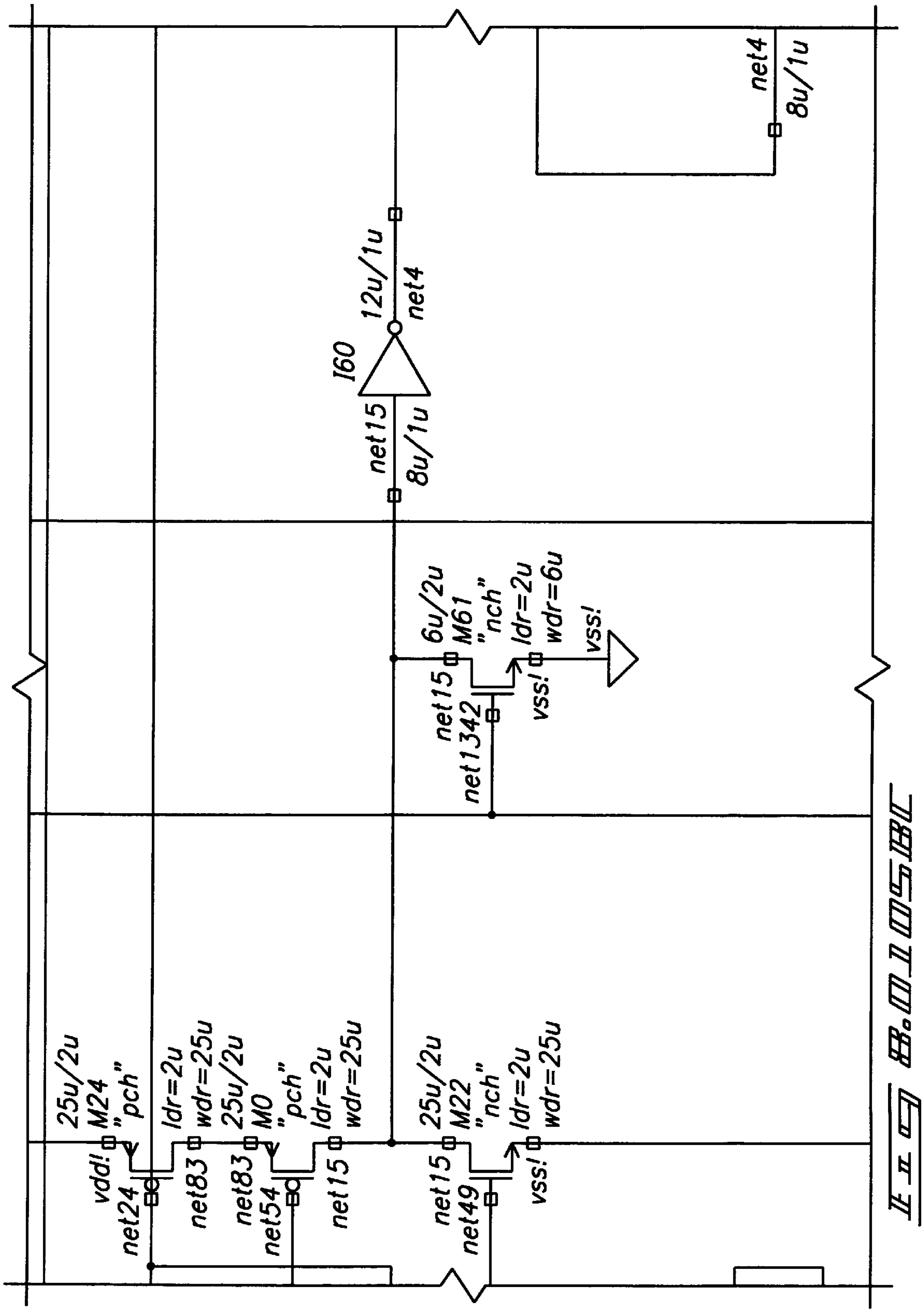
FIG 8.0105BC

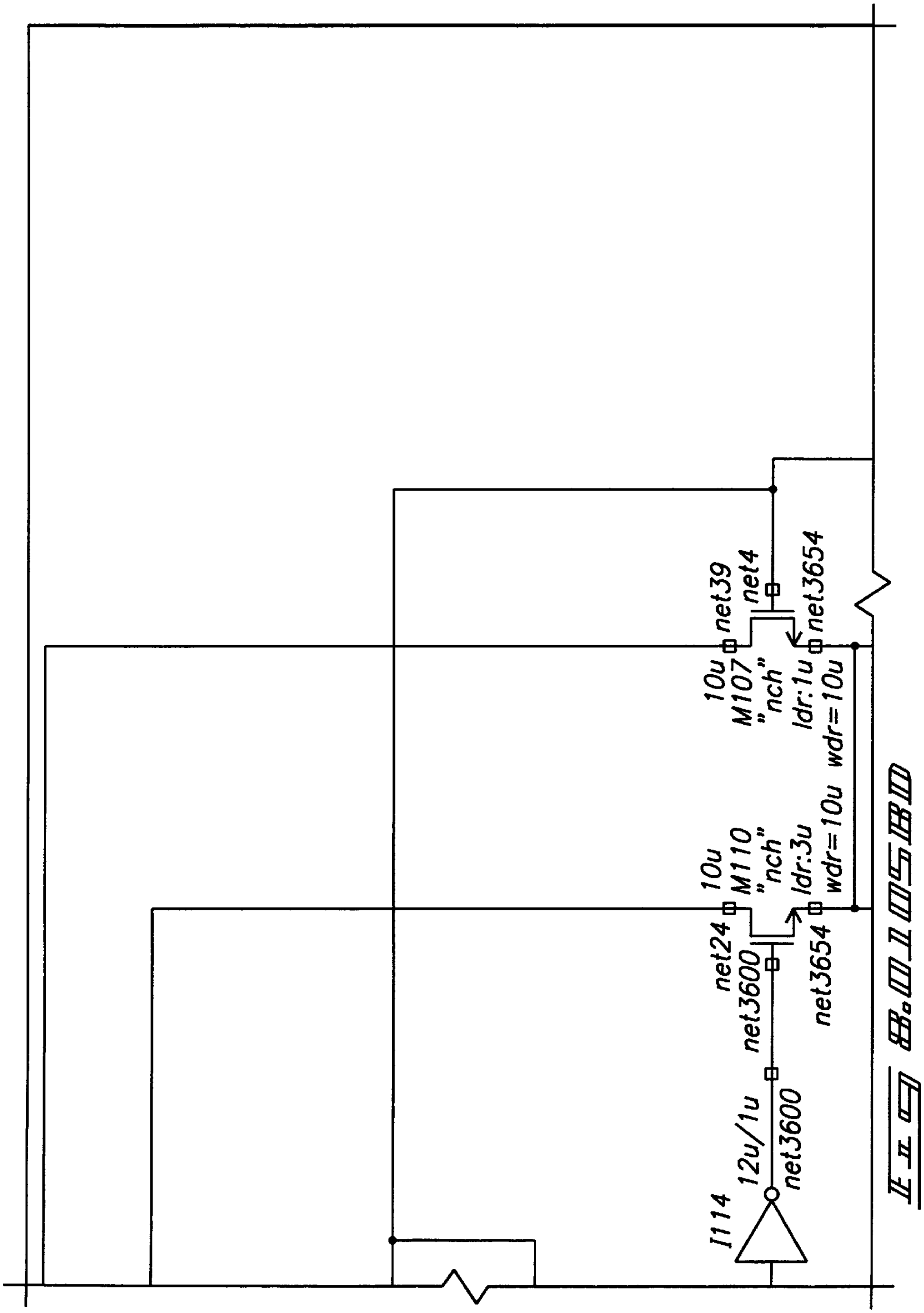
FIG. 8.1105BD

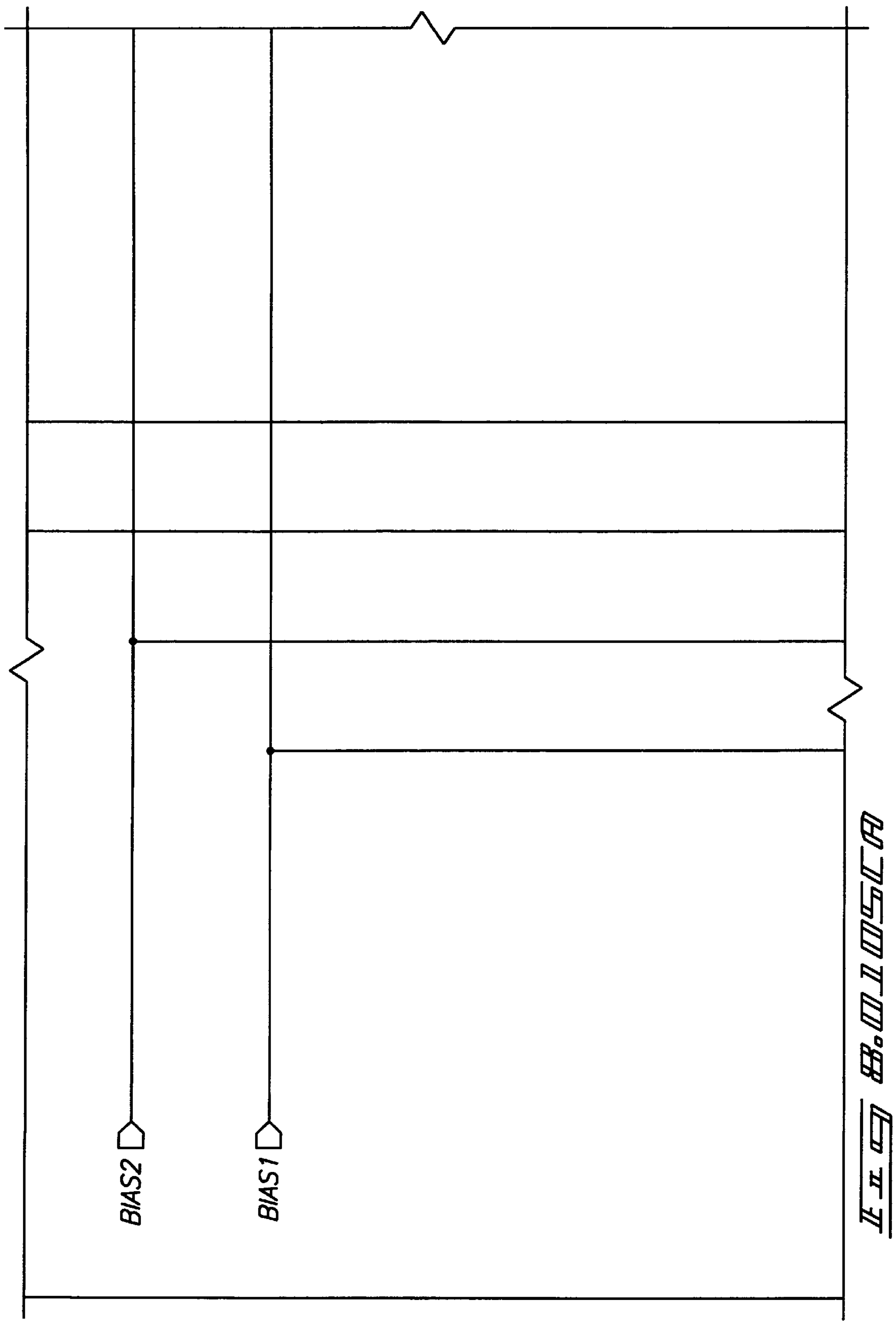
Fig. 8.0105CA

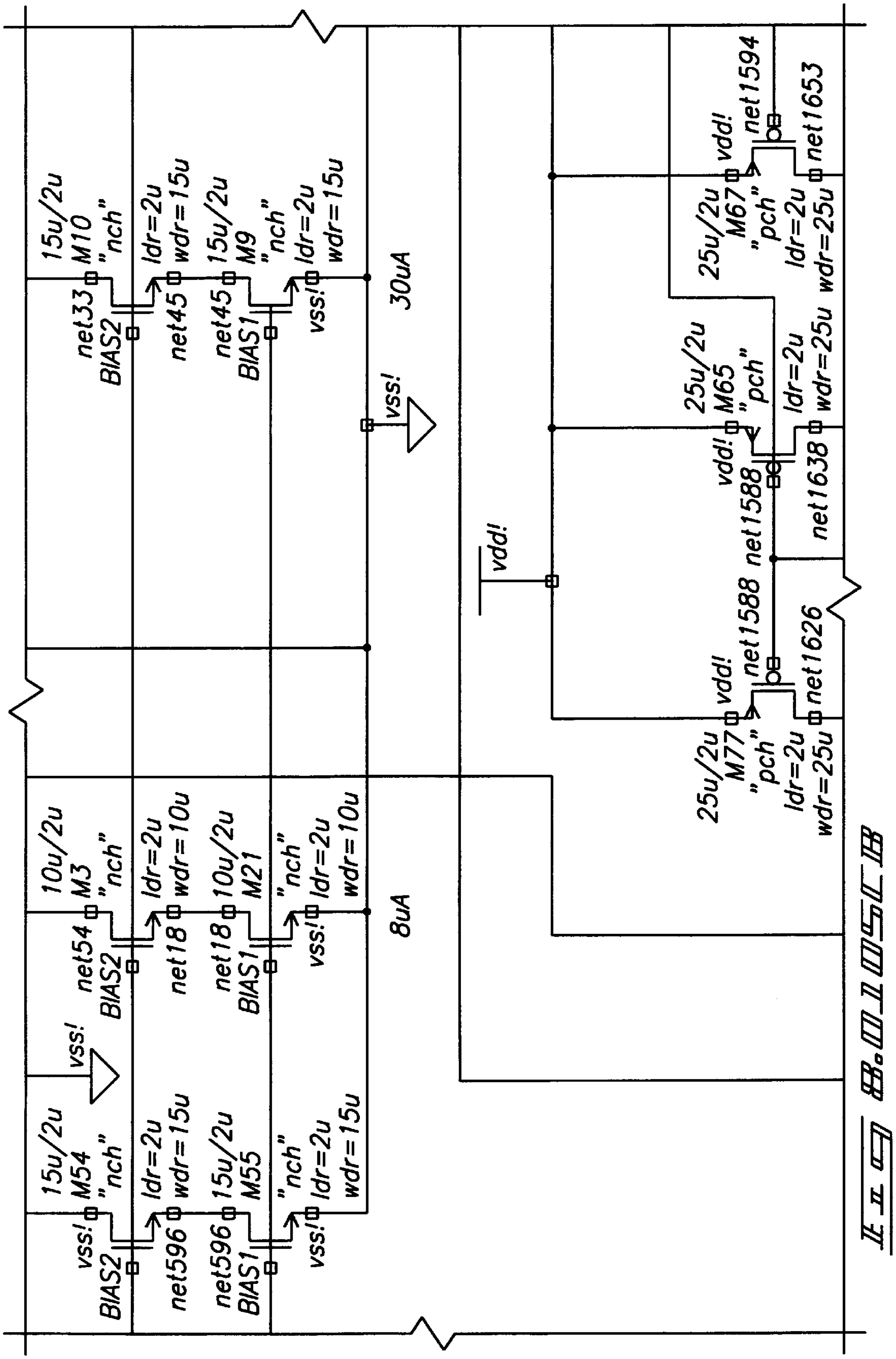
Fig 8.010SCB

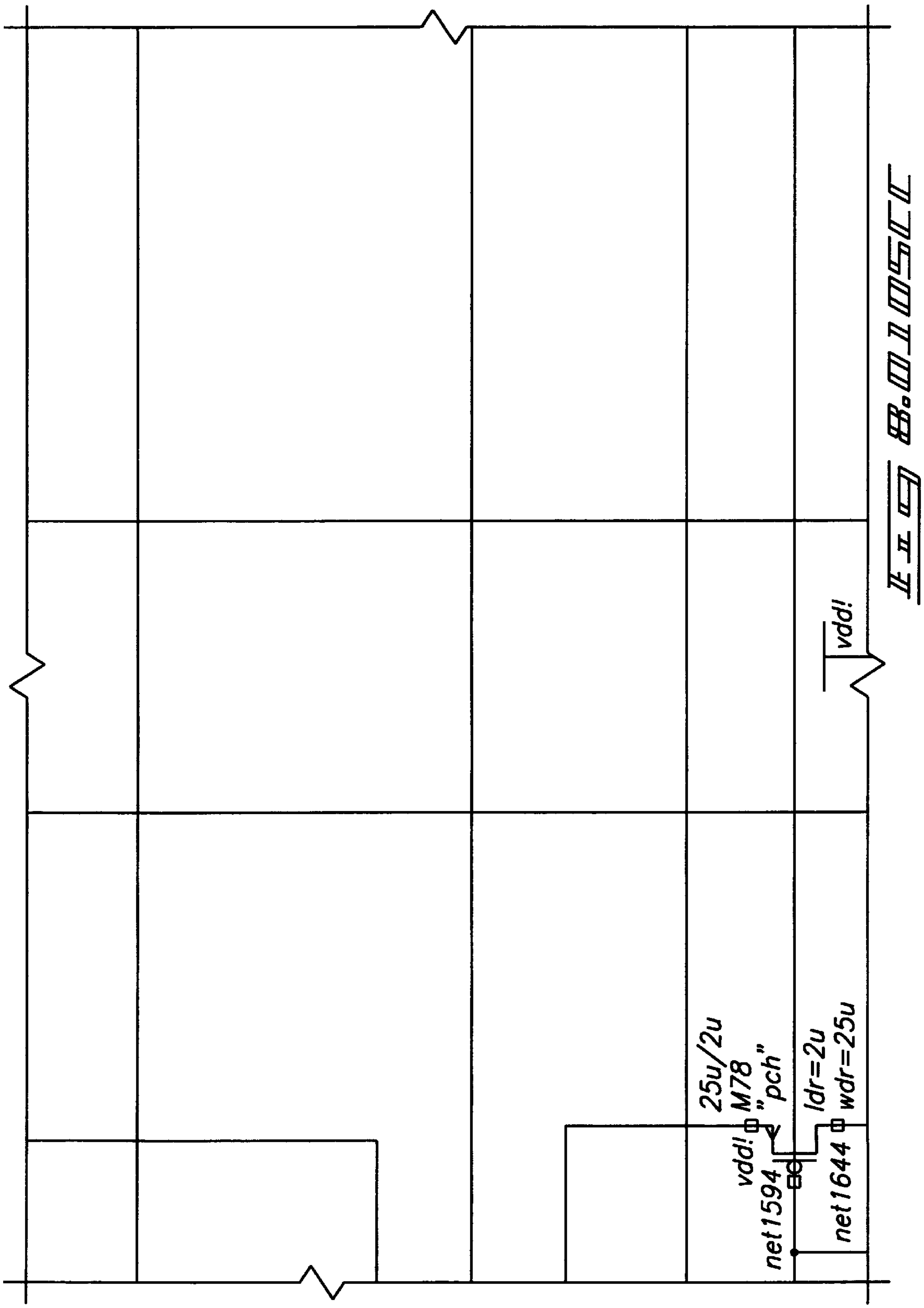
FIG. 8.010SCC

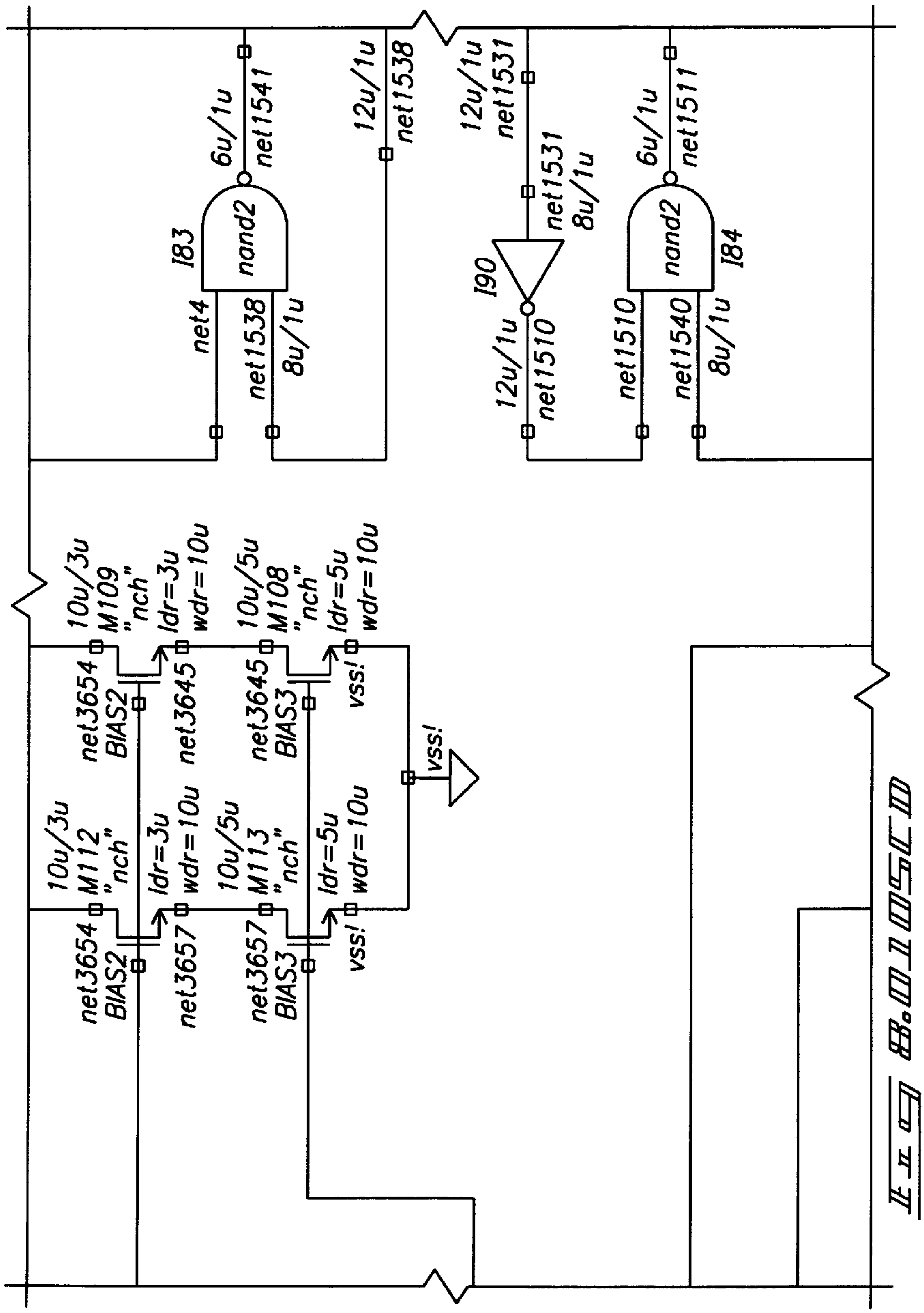
FIG. 8.010SCD

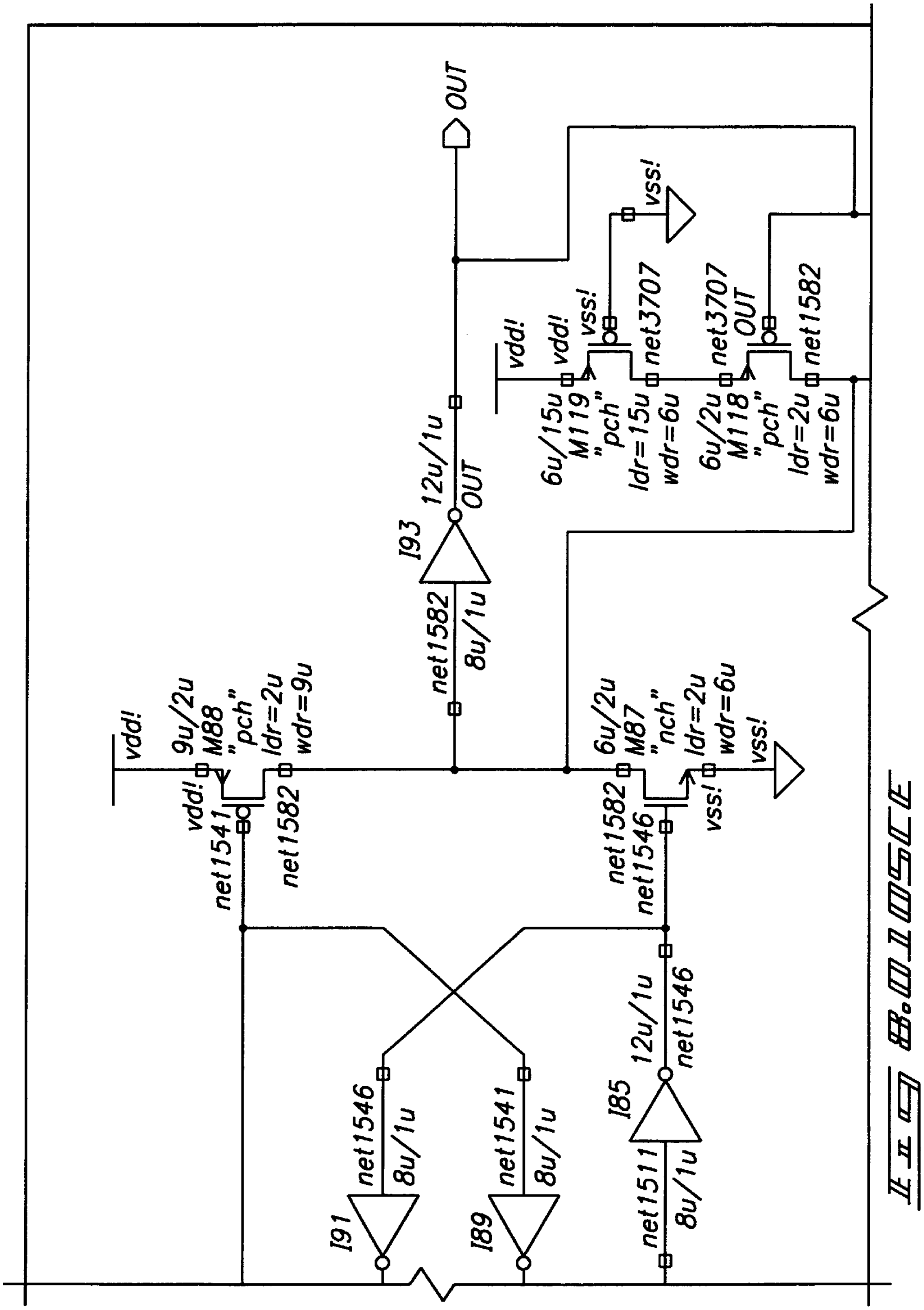
FIG 8.010SCE

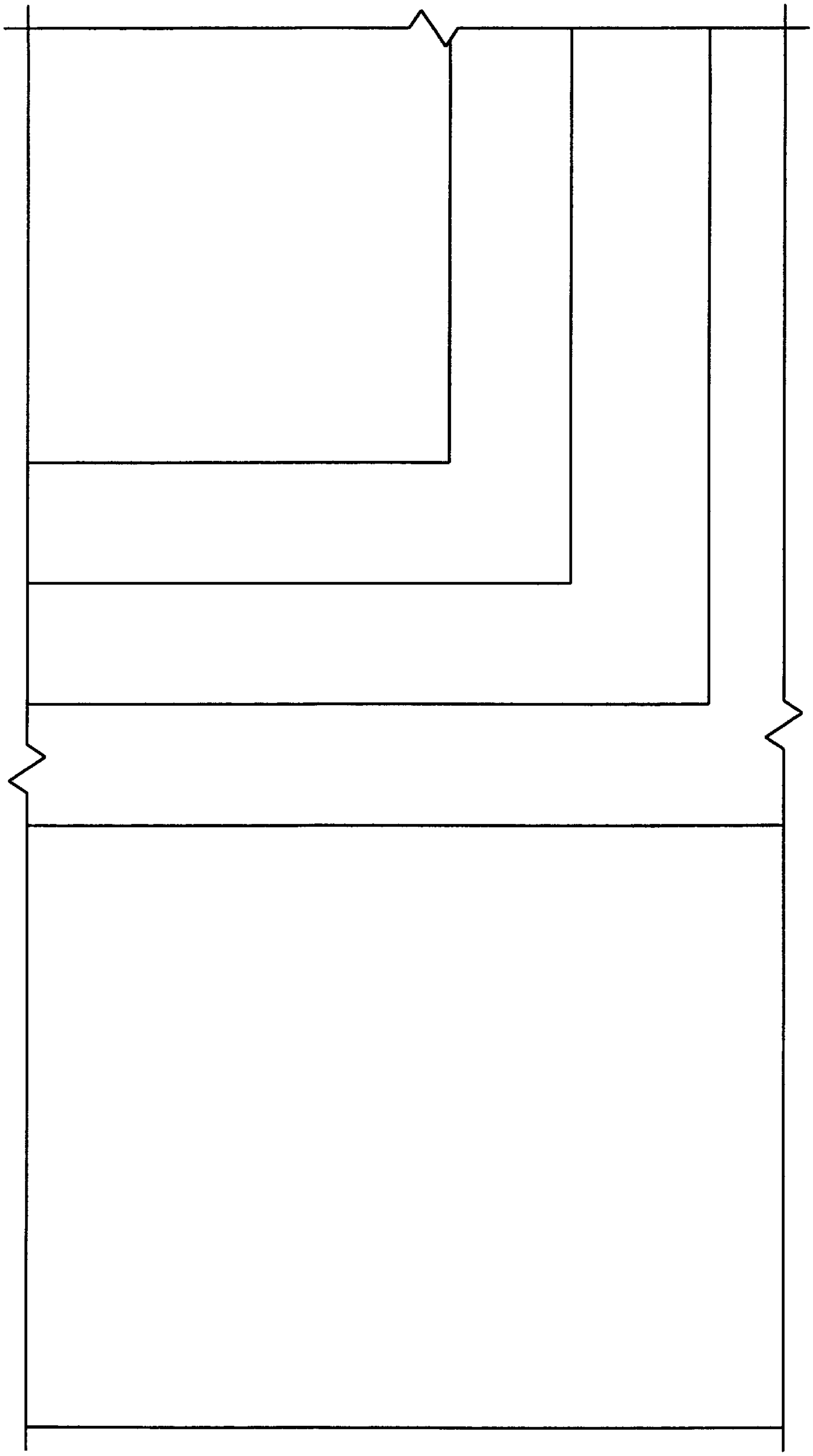
FIG. 8.0105DA

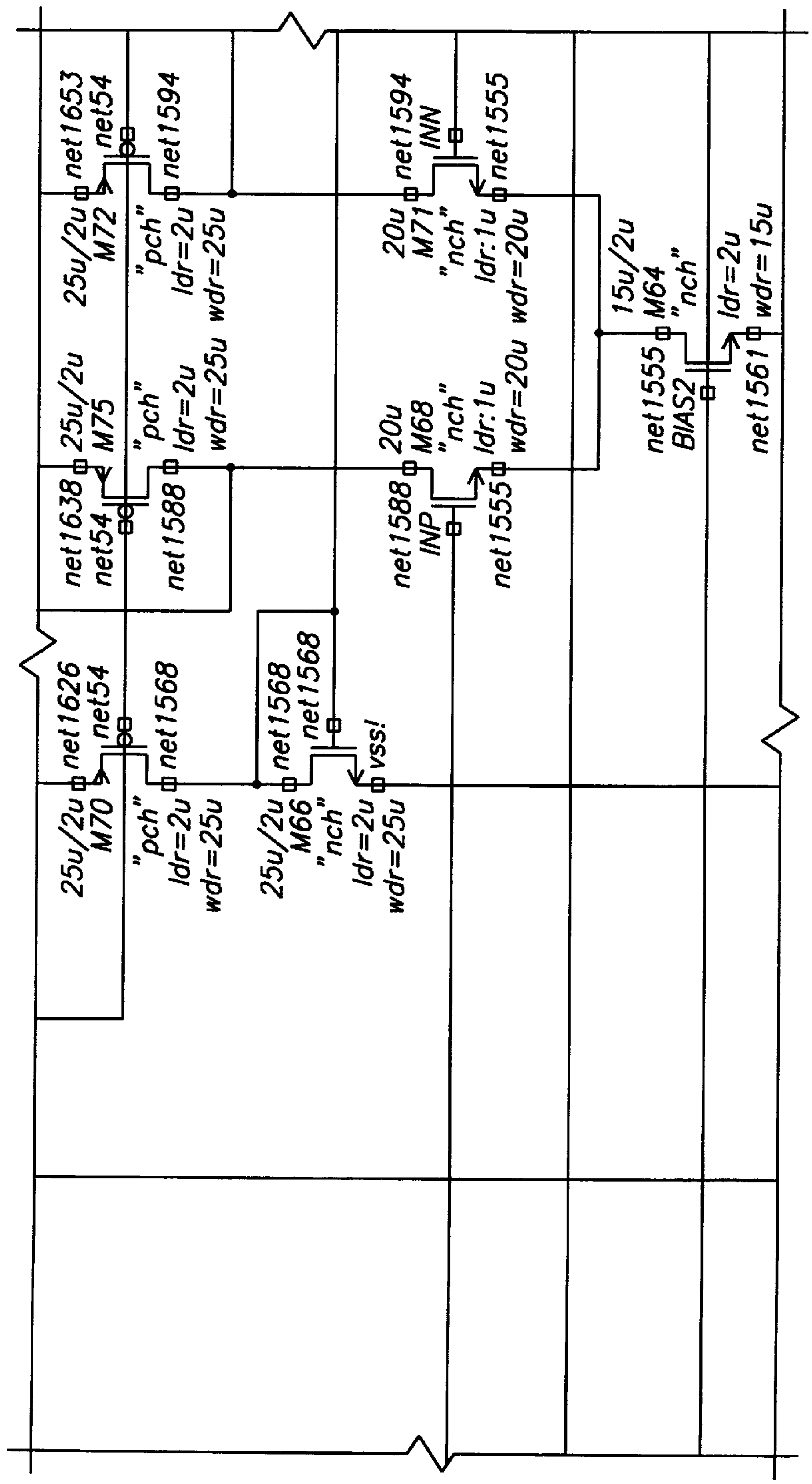
FIG. 8.010SDB

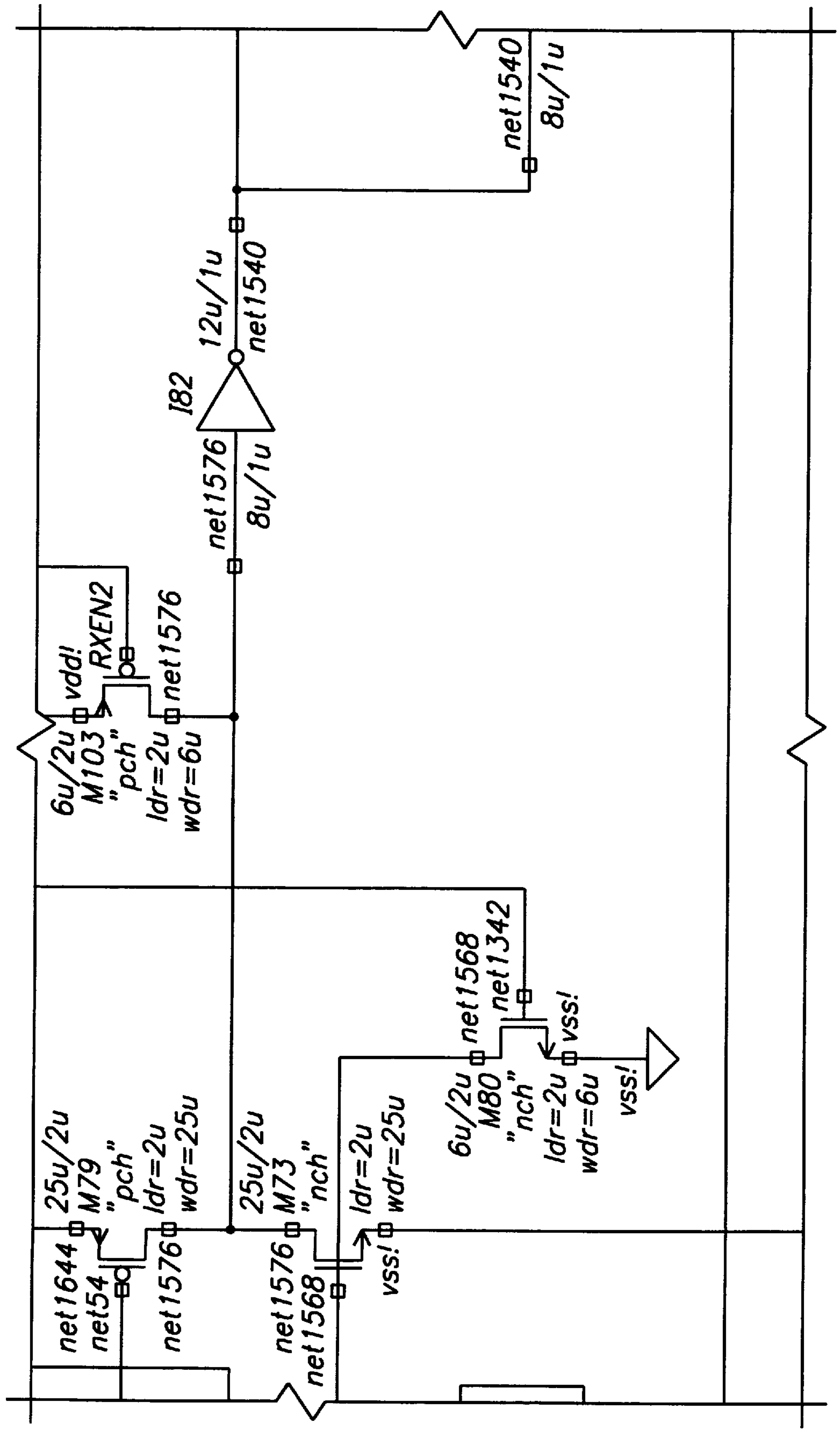
Fig 8.010SDC

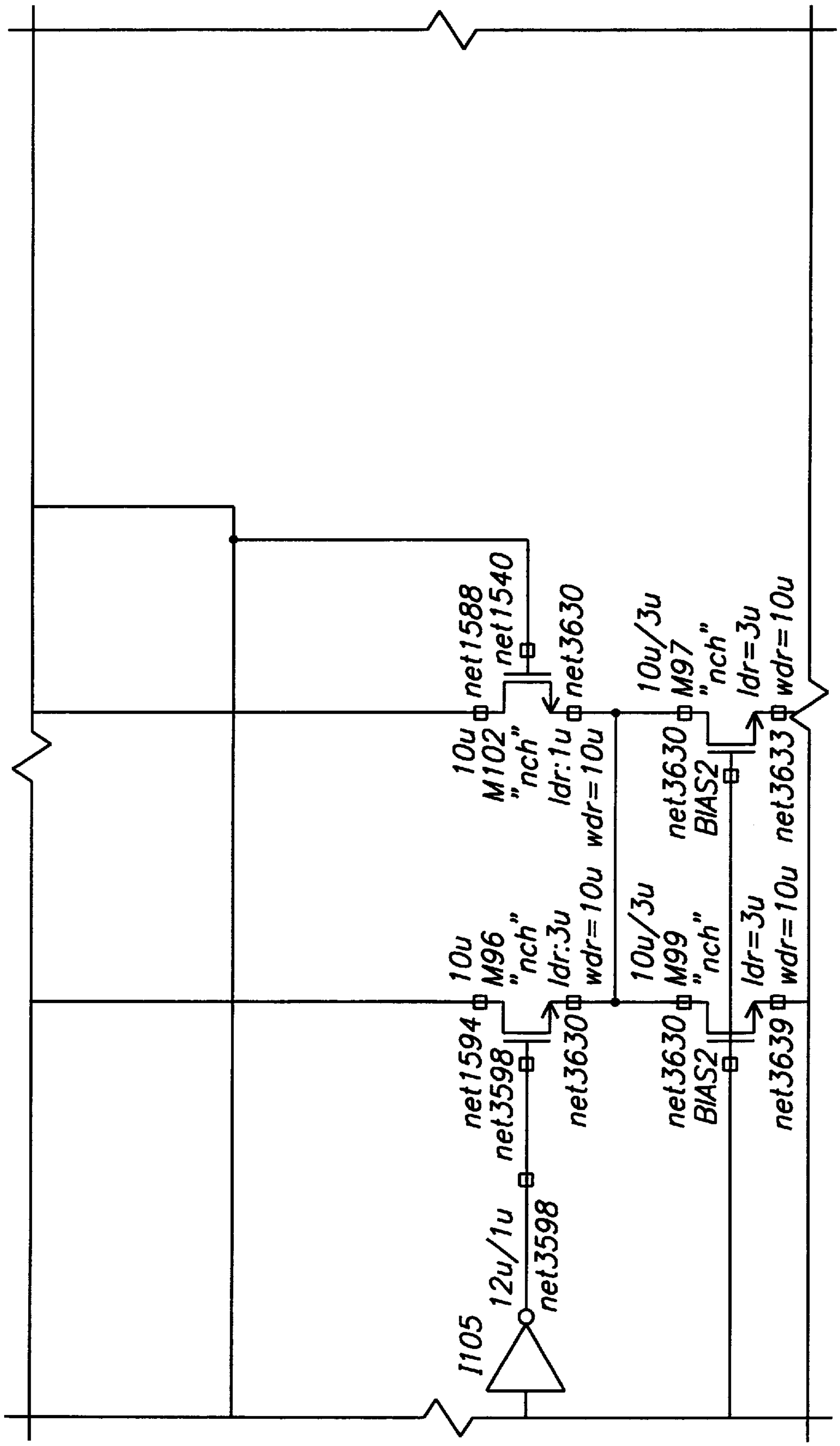
Fig 8.0105D

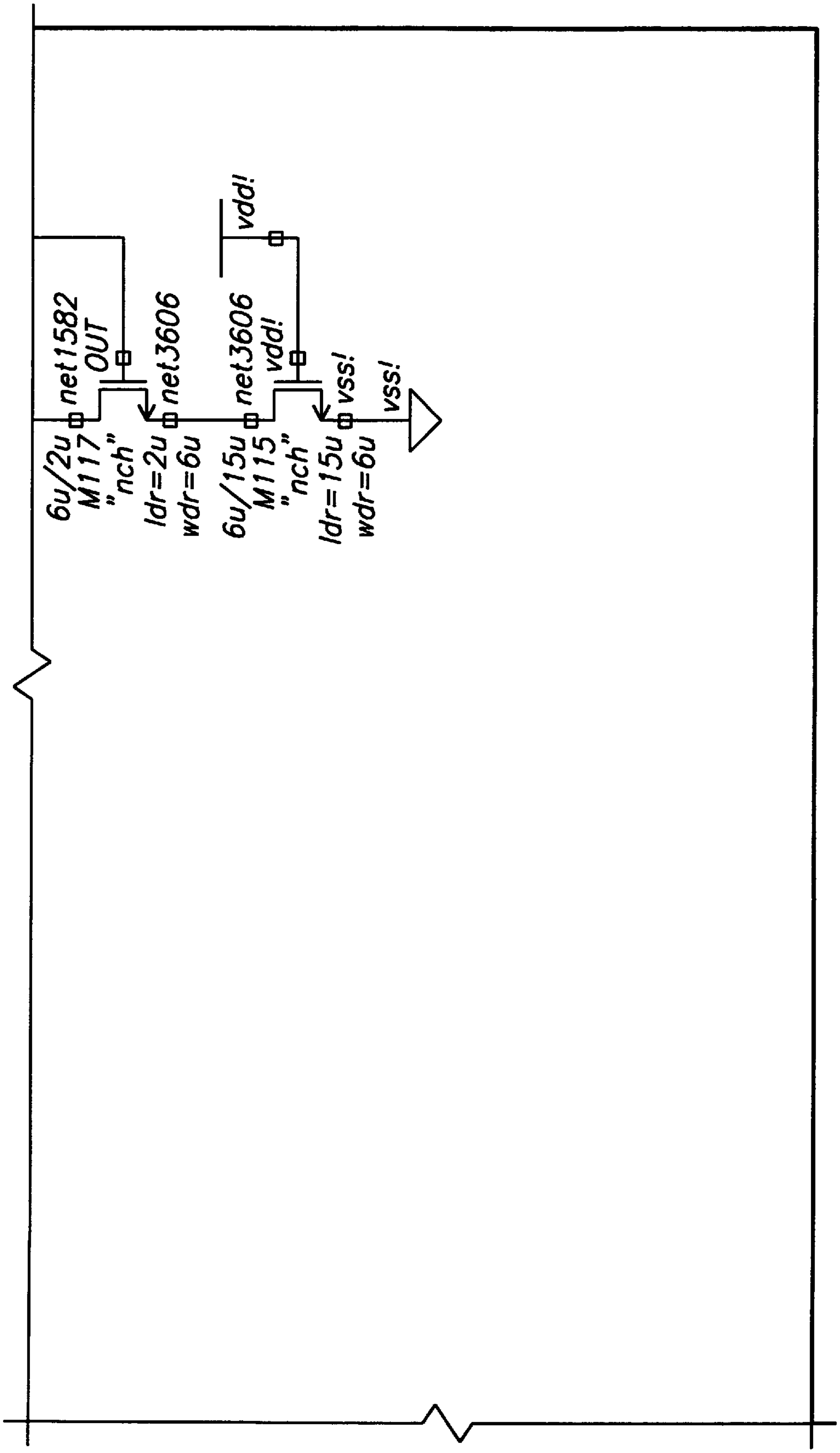
FIG. 8.010SDE

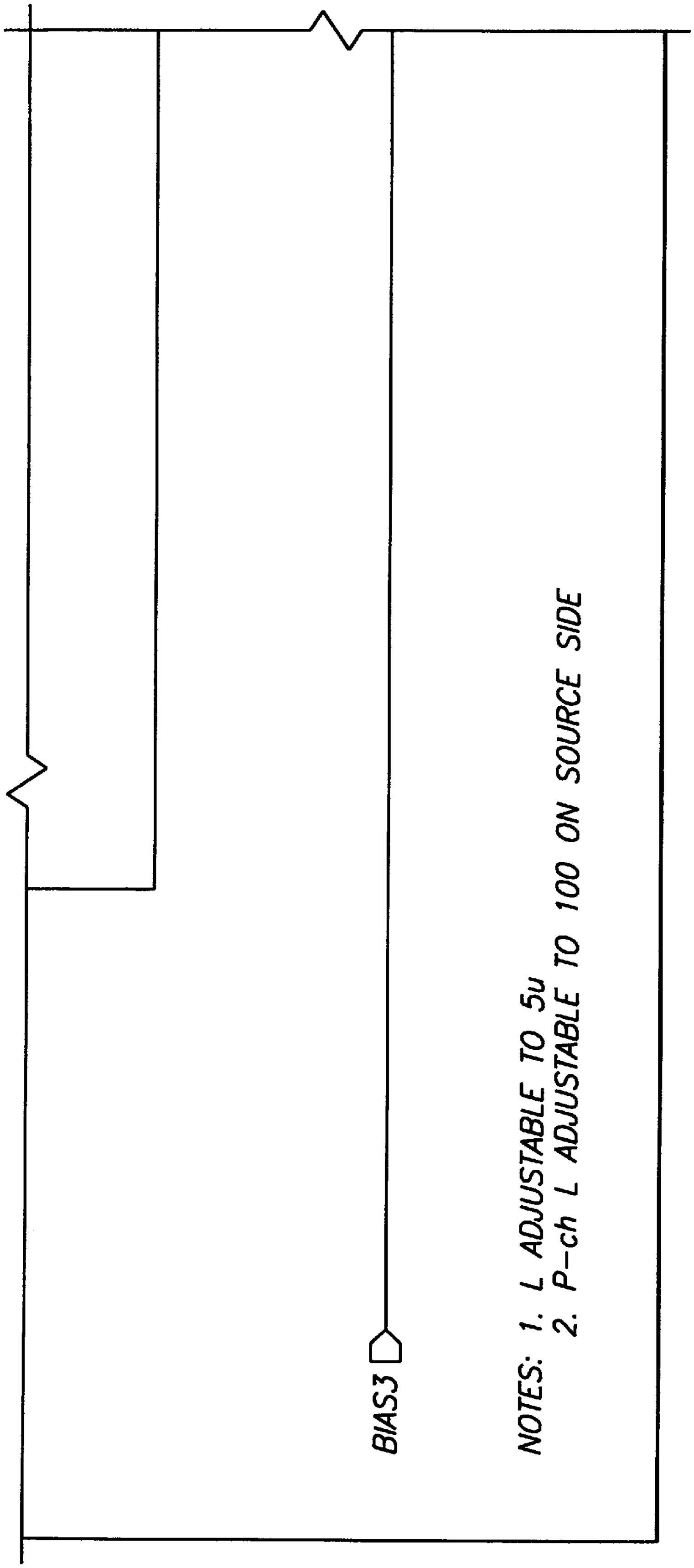
Fig 8.0105EA

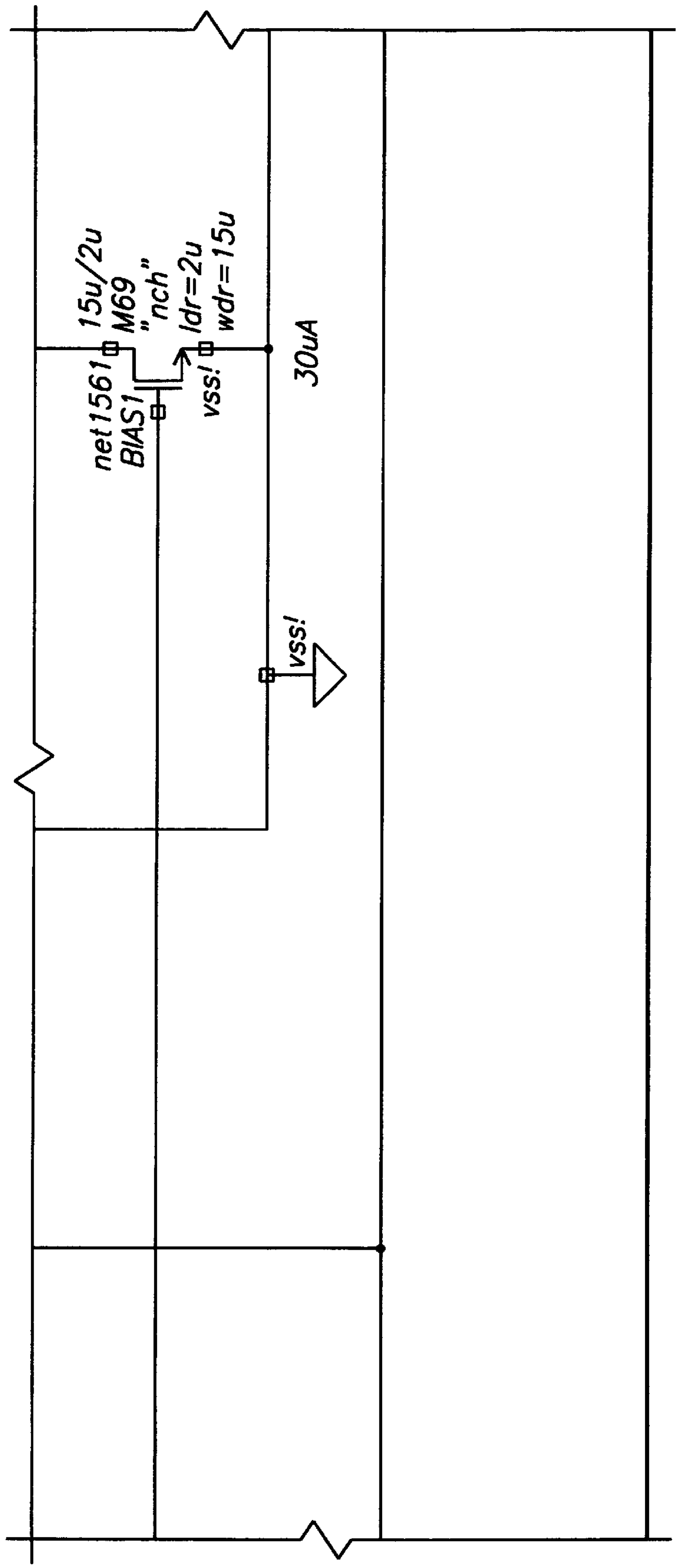
FIG. 8.0105EB

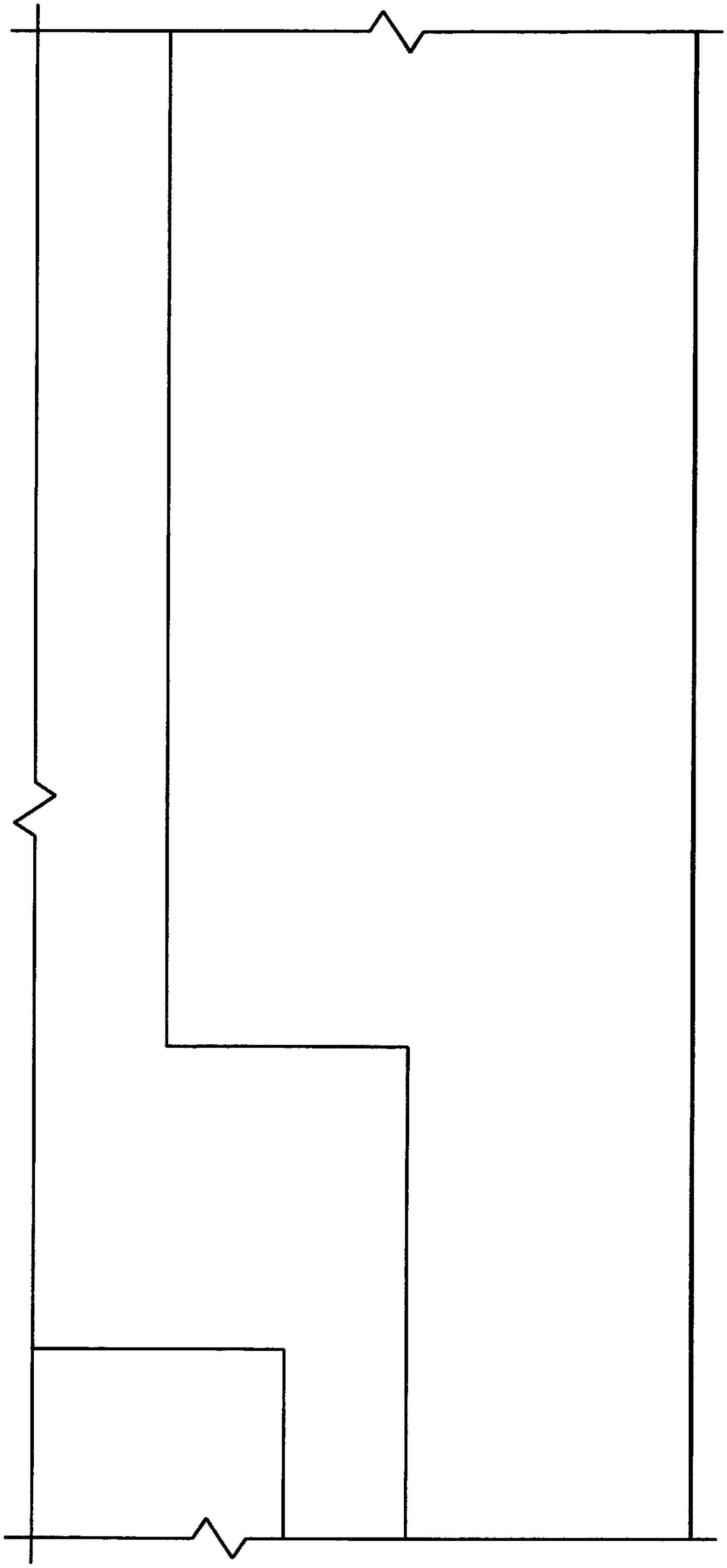
FIG. 8.0105EL

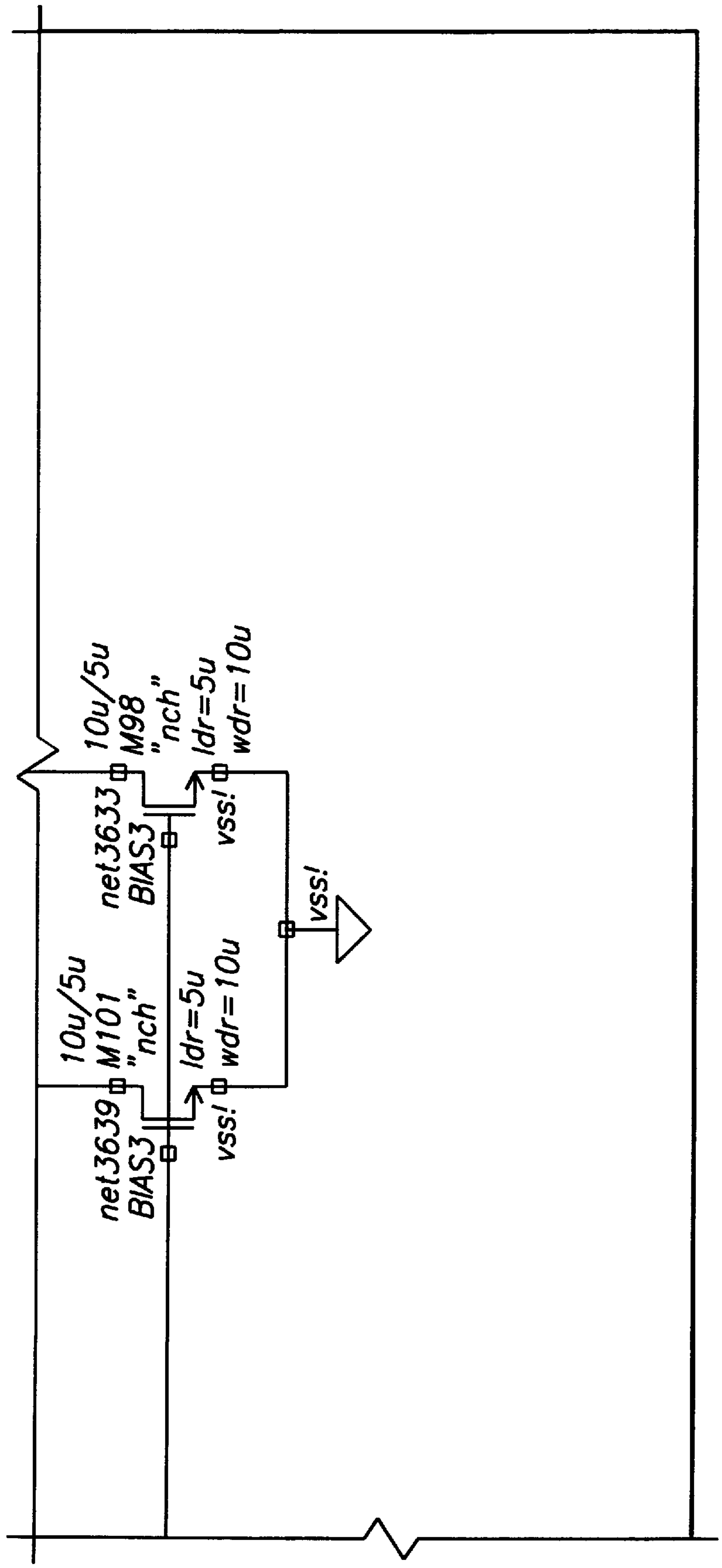
Fig. 8.010SED

| | | | |
|---|---|---|---|
| 8.0106AA | 8.0106AB | 8.0106AC | 8.0106AD |
| 8.0106BA | 8.0106BB | 8.0106BC | 8.0106BD |
| 8.0106CA | 8.0106CB | 8.0106CC | 8.0106CD |

Fig. 8.0106

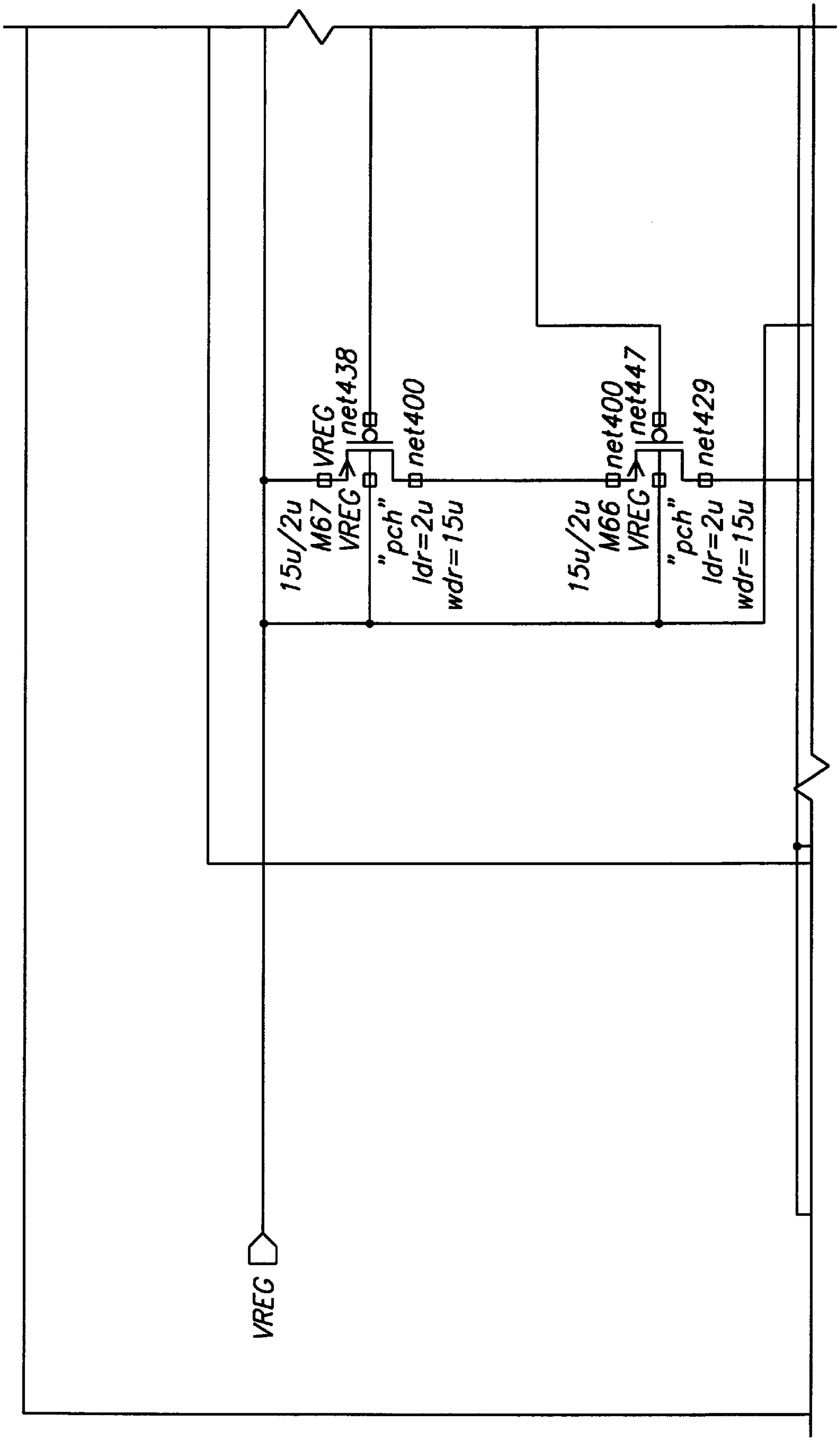
FIG. 8.010GAA

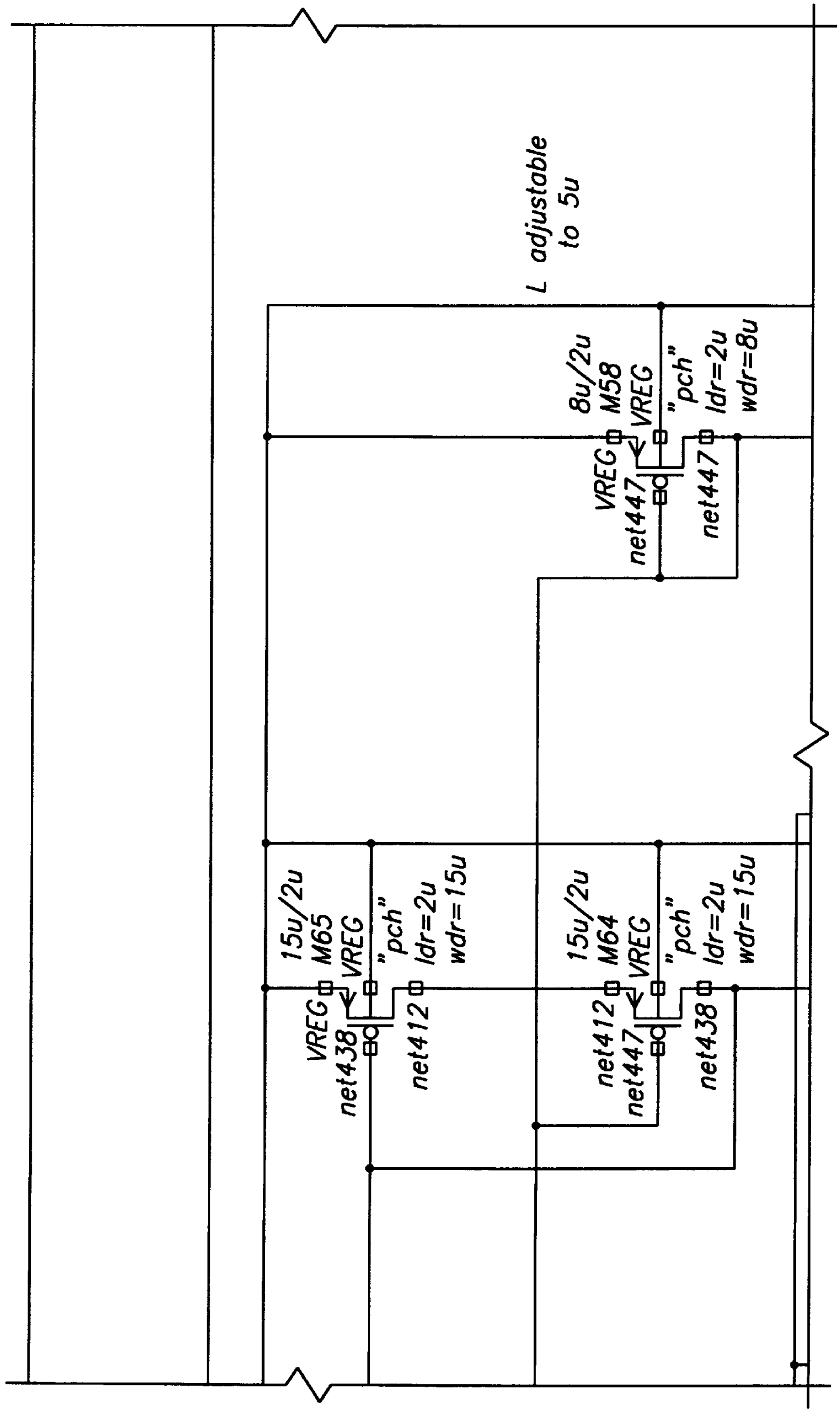
Fig. 8.0106AB

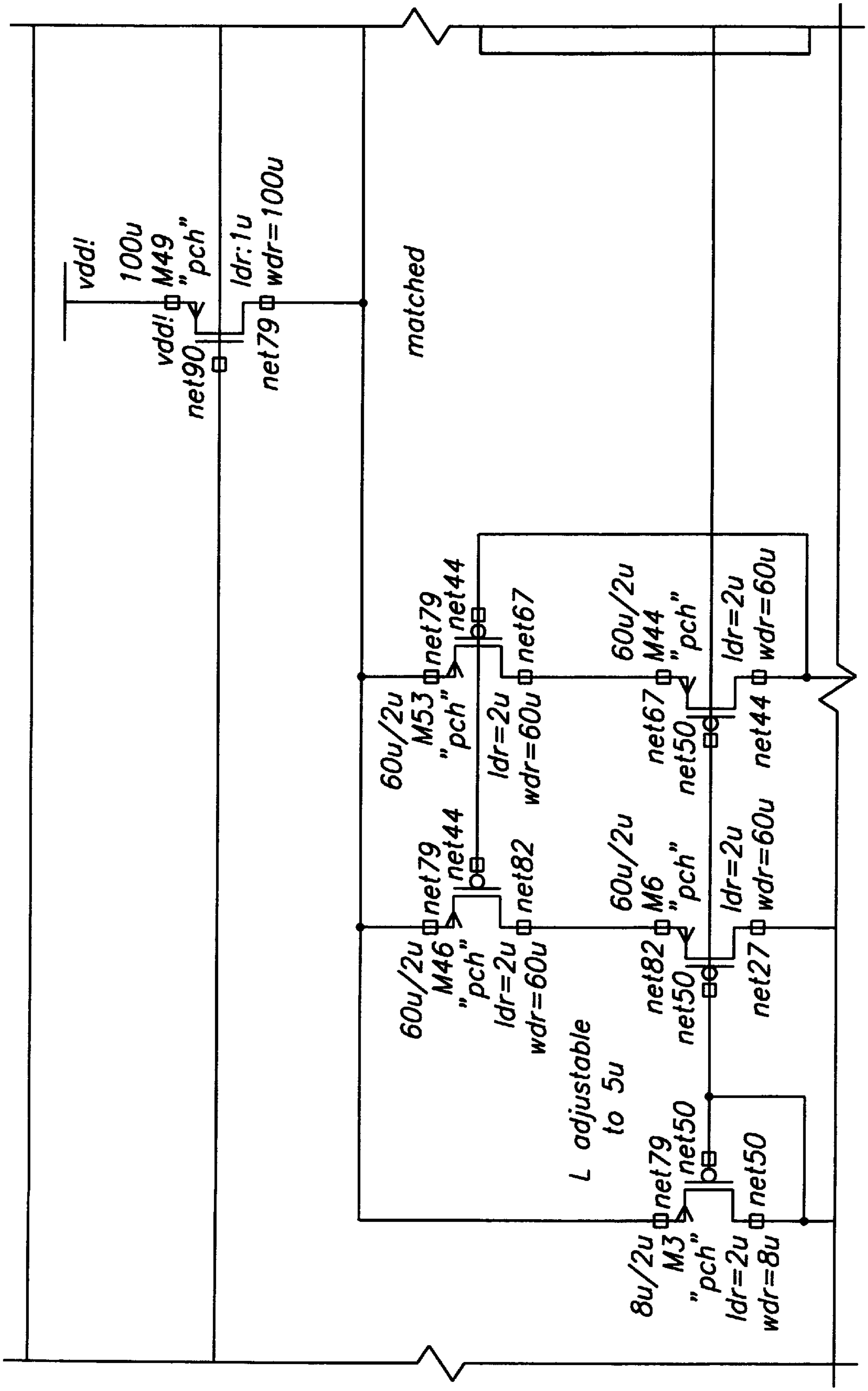
Fig. 8.01.06AC

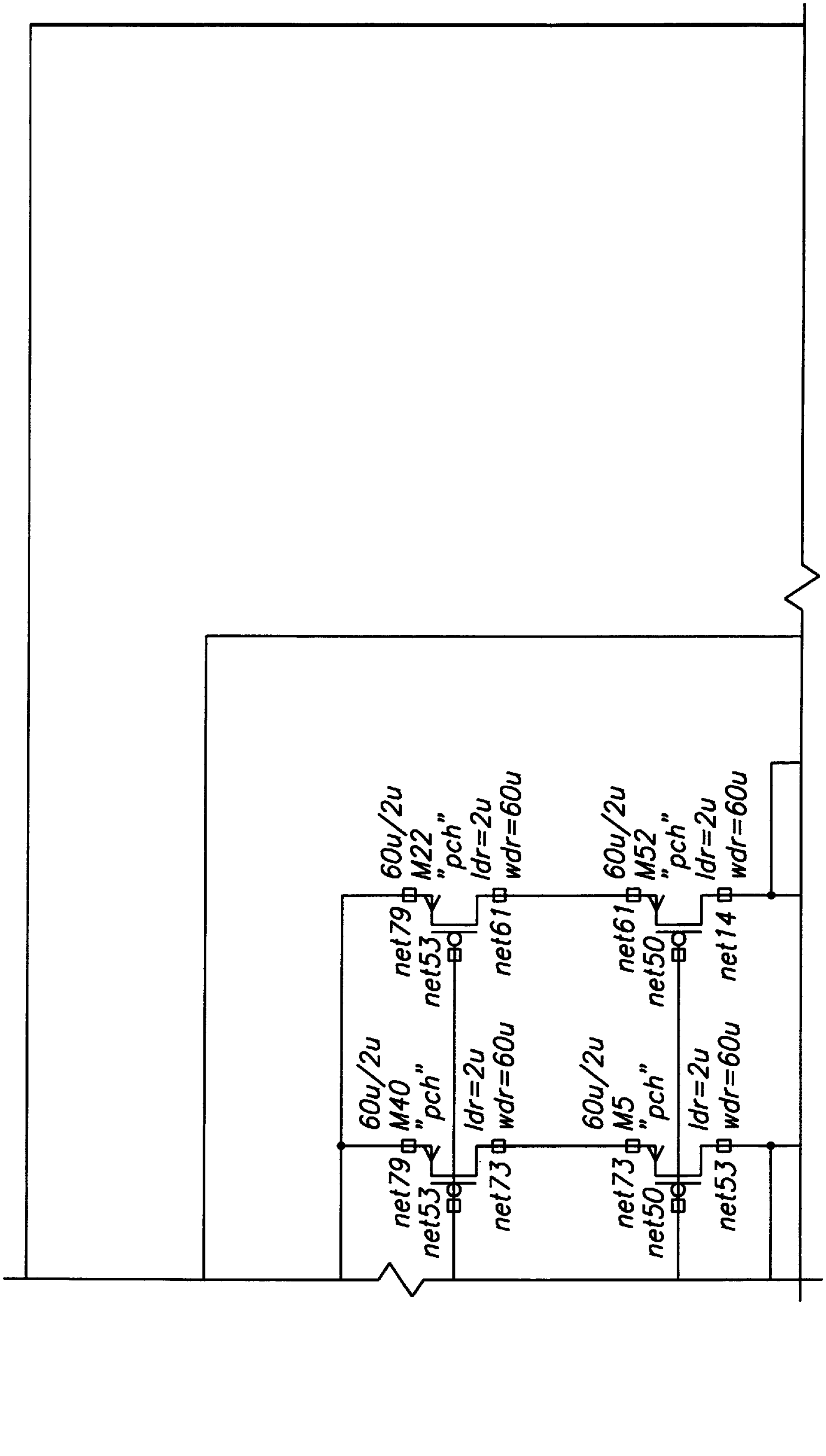
Fig. 8.010GAD

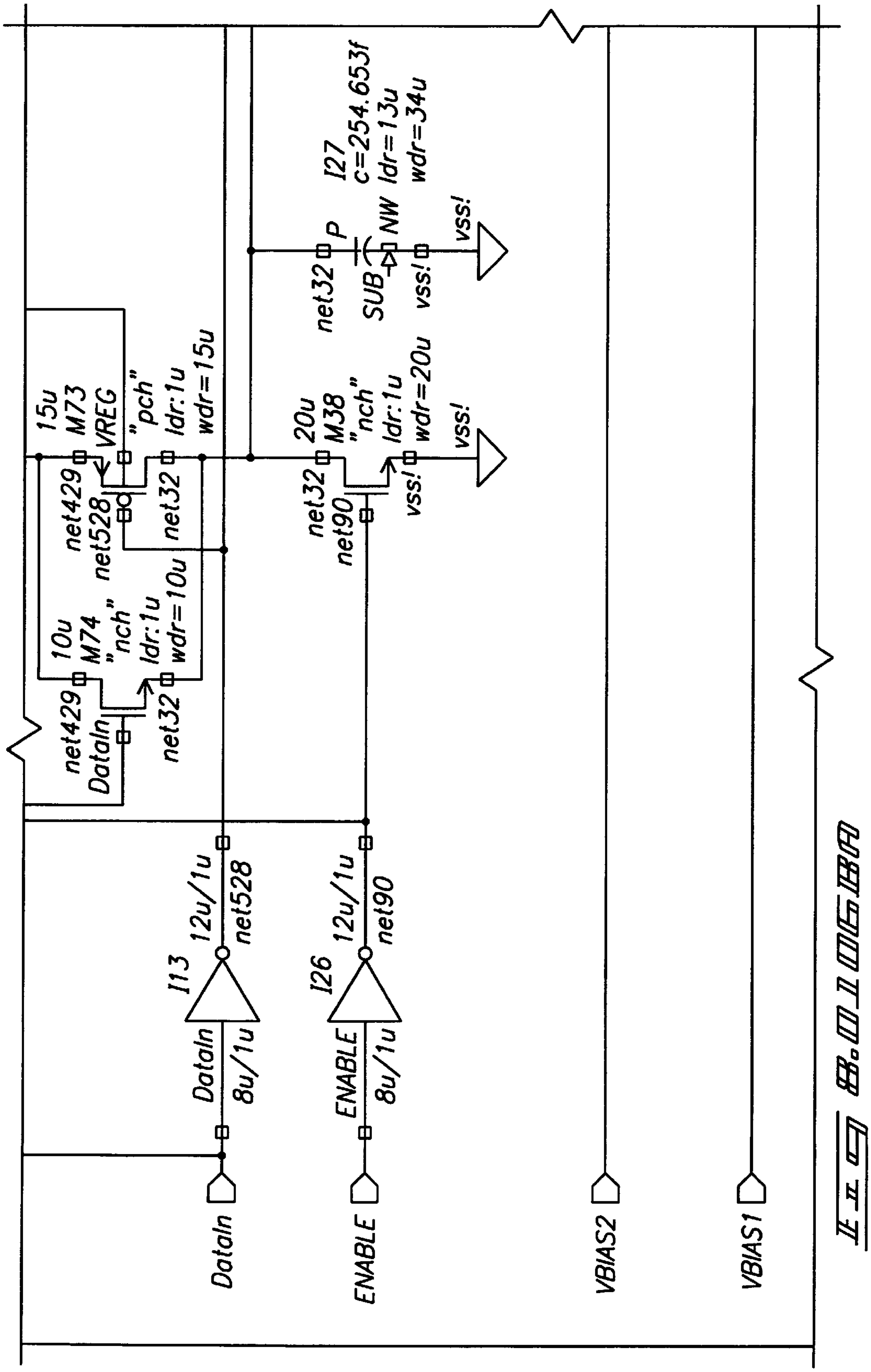
FIG. 8.0106BA

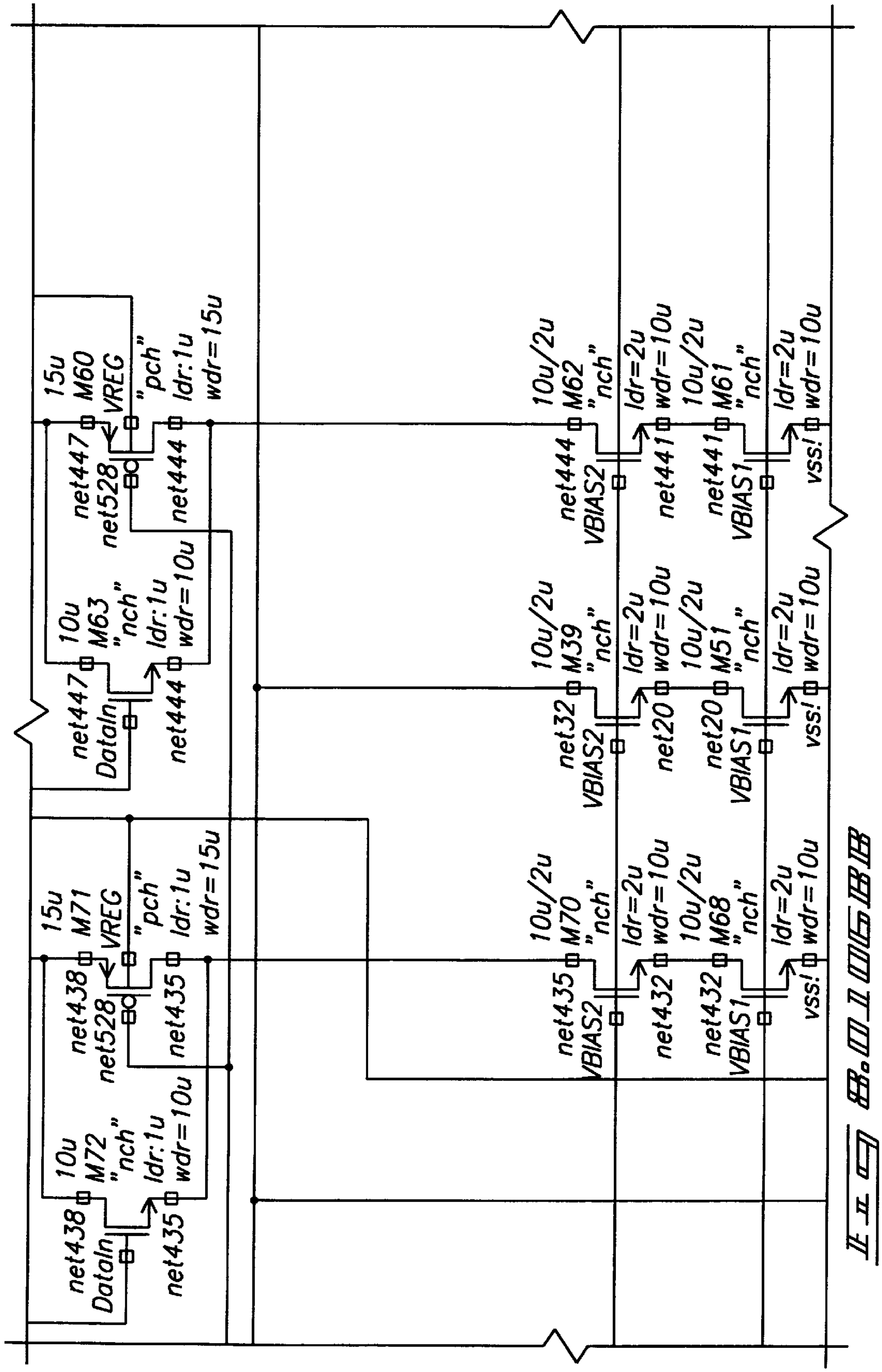
Fig. 8.0106BB

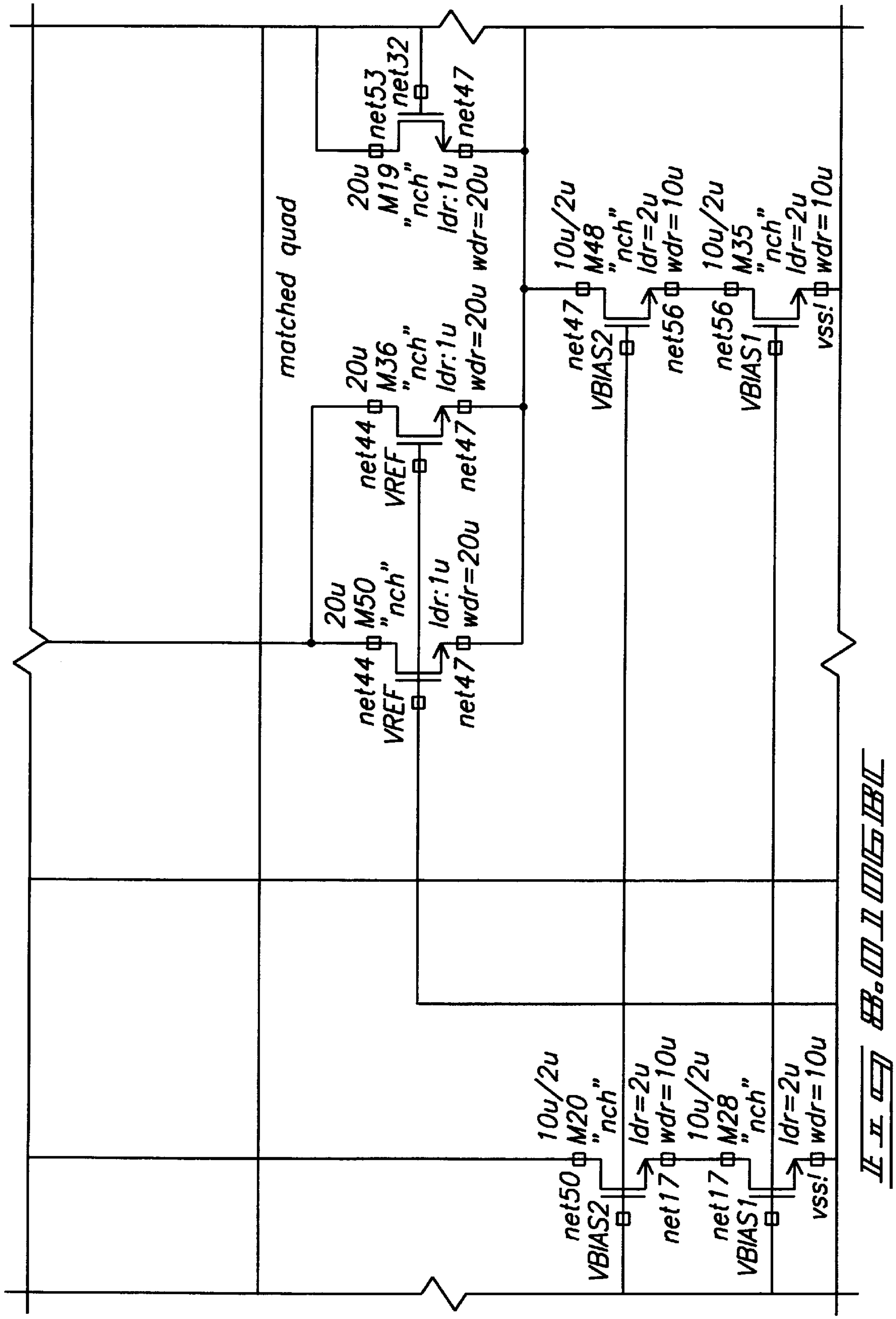
FIG. 8.1106BC

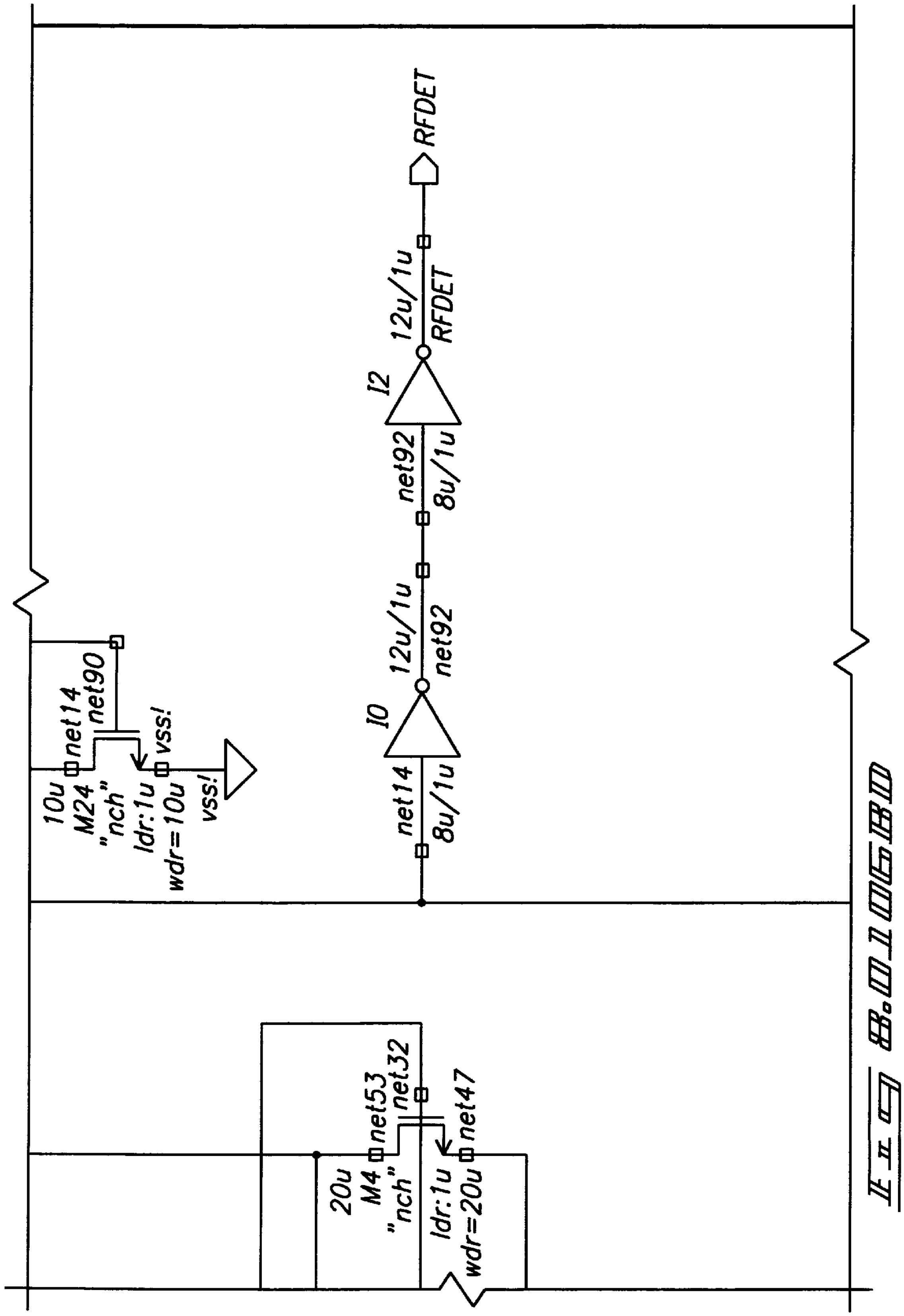
FIG. 8.0106BD

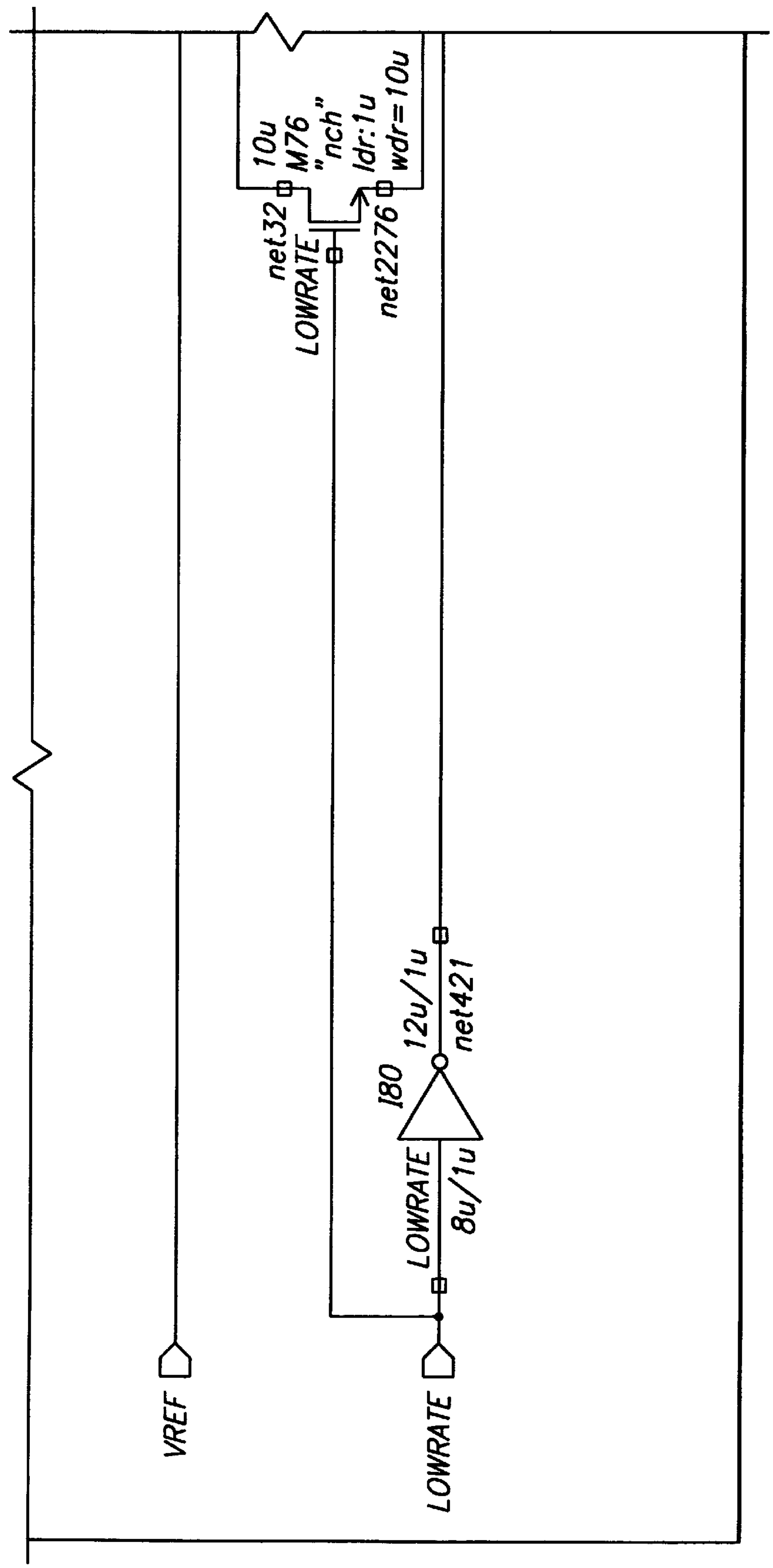
Fig 8.01.06CA

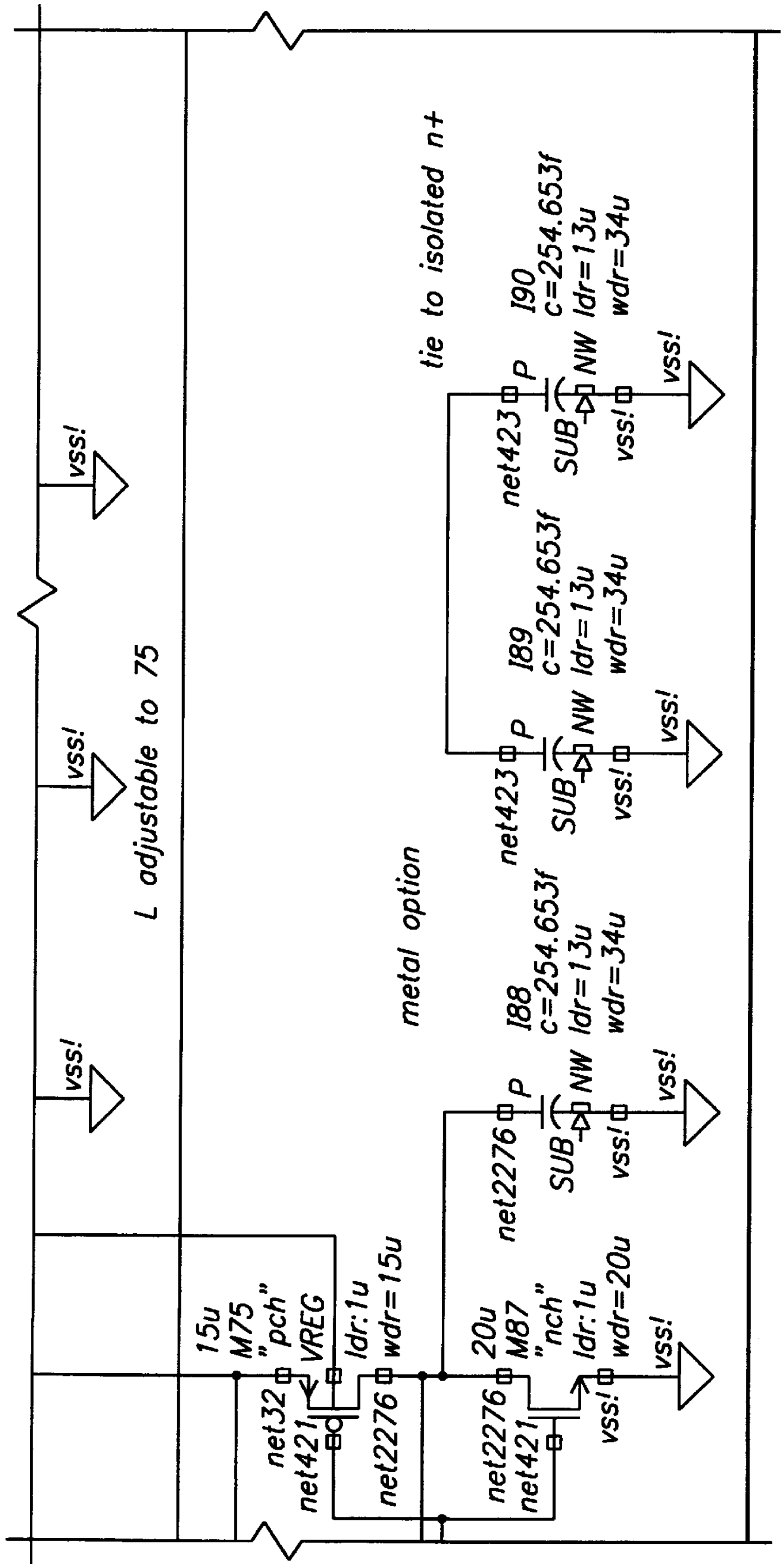
FIG. 8.010GB

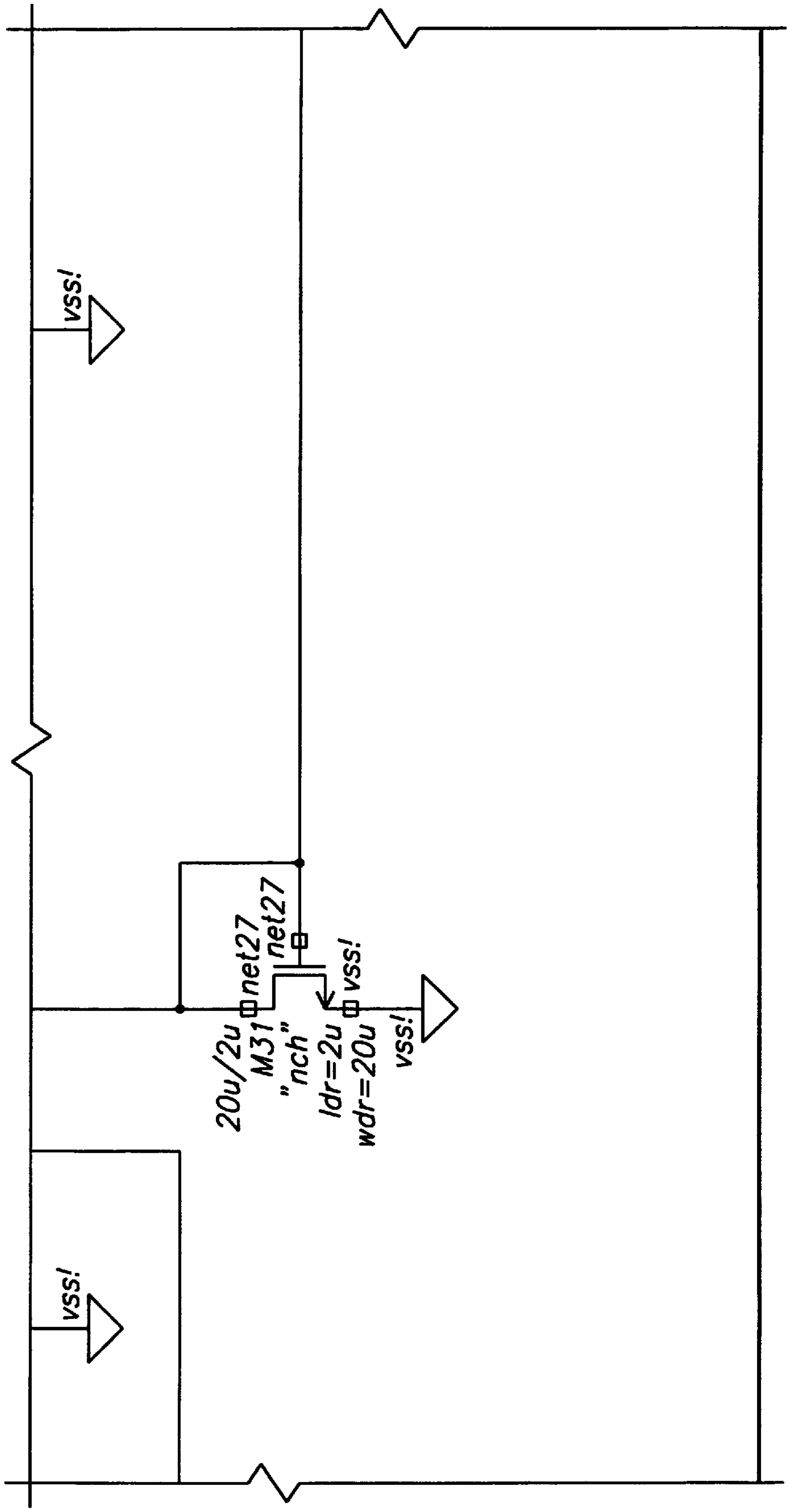
FIG. 8.01.06CC

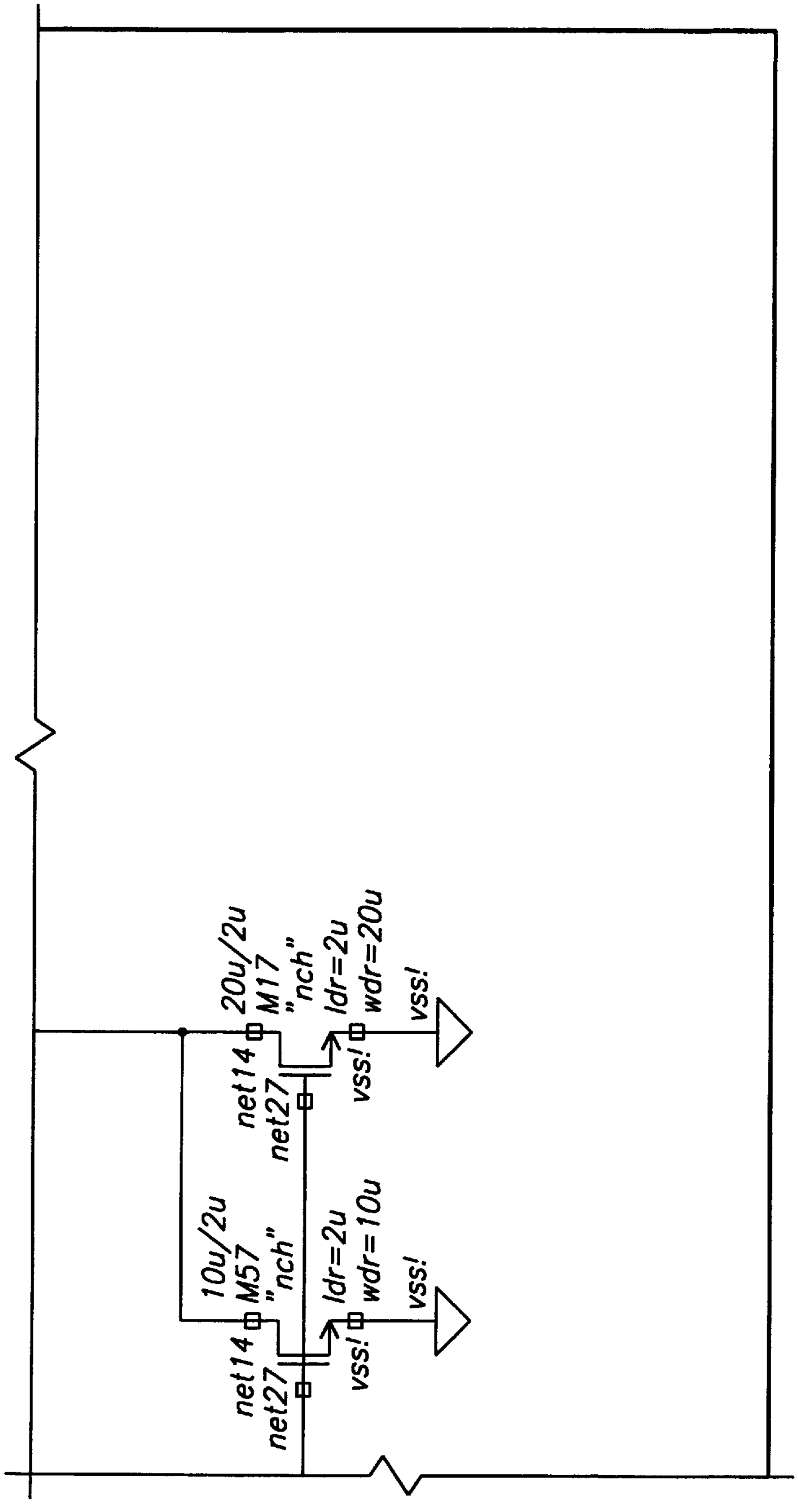
FIG. 8.01.06CD

| | | | | | | | | | | | | | |
|---|---|---|---|---|---|---|---|---|---|---|---|---|---|
| 8.0107AA | 8.0107AB | 8.0107AC | 8.0107AD | 8.0107AE | 8.0107AF | 8.0107AG | 8.0107AH | 8.0107AI | 8.0107AJ | 8.0107AK | 8.0107AL | 8.0107AM | |
| 8.0107BA | 8.0107BB | 8.0107BC | 8.0107BD | 8.0107BE | 8.0107BF | 8.0107BG | 8.0107BH | 8.0107BI | 8.0107BJ | 8.0701BK | 8.0107BL | 8.0107BM | |
| 8.0107CA | 8.0107CB | 8.0107CC | 8.0107CD | 8.0107CE | 8.0107CF | 8.0107CG | 8.0107CH | 8.0107CI | 8.0107CJ | 8.0107CK | 8.0107CL | 8.0107CM | 8.0107CN |
| 8.0107DA | 8.0107DB | 8.0107DC | 8.0107DD | 8.0107DE | 8.0107DF | 8.0107DG | 8.0107DH | 8.0107DI | 8.0107DJ | 8.0107DK | 8.0107DL | 8.0107DM | 8.0107DN |
| 8.0107EA | 8.0107EB | 8.0107EC | 8.0107ED | 8.0107EE | 8.0107EF | 8.0107EG | 8.0107EH | 8.0107EI | 8.0107EJ | 8.0107EK | 8.0107EL | 8.0107EM | 8.0107EN |
| 8.0107FA | 8.0107FB | 8.0107FC | 8.0107FD | 8.0107FE | 8.0107FF | 8.0107FG | 8.0107FH | 8.0107FI | 8.0107FJ | 8.0107FK | 8.0107FL | 8.0107FM | 8.0107FN |
| 8.0107GA | 8.0107GB | 8.0107GC | 8.0107GD | 8.0107GE | 8.0107GF | 8.0107GG | 8.0107GH | 8.0107GI | 8.0107GJ | 8.0107GK | 8.0107GL | 8.0107GM | 8.0107GN |

Fig. 8.0107

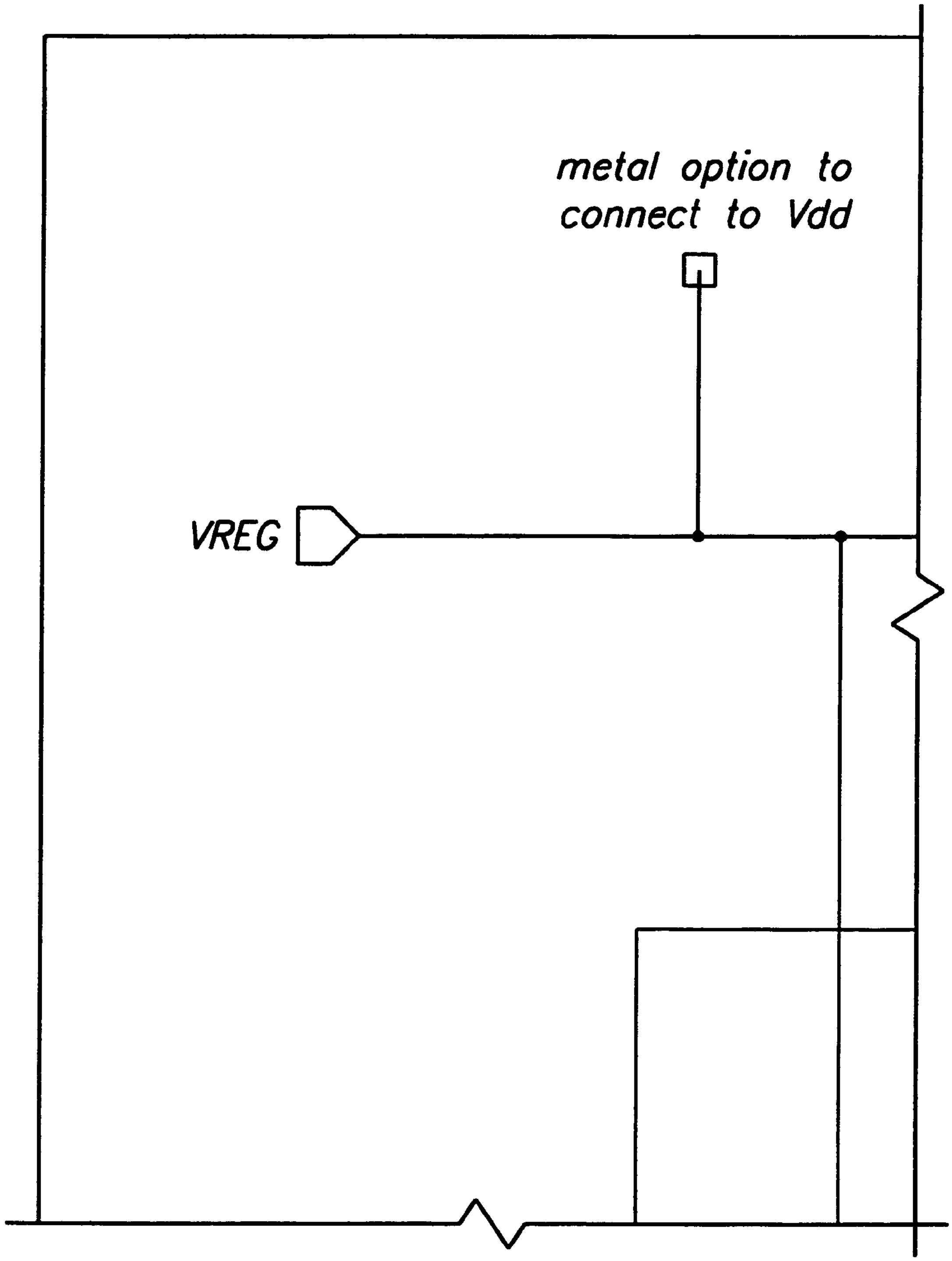
FIG. 8.0101AA

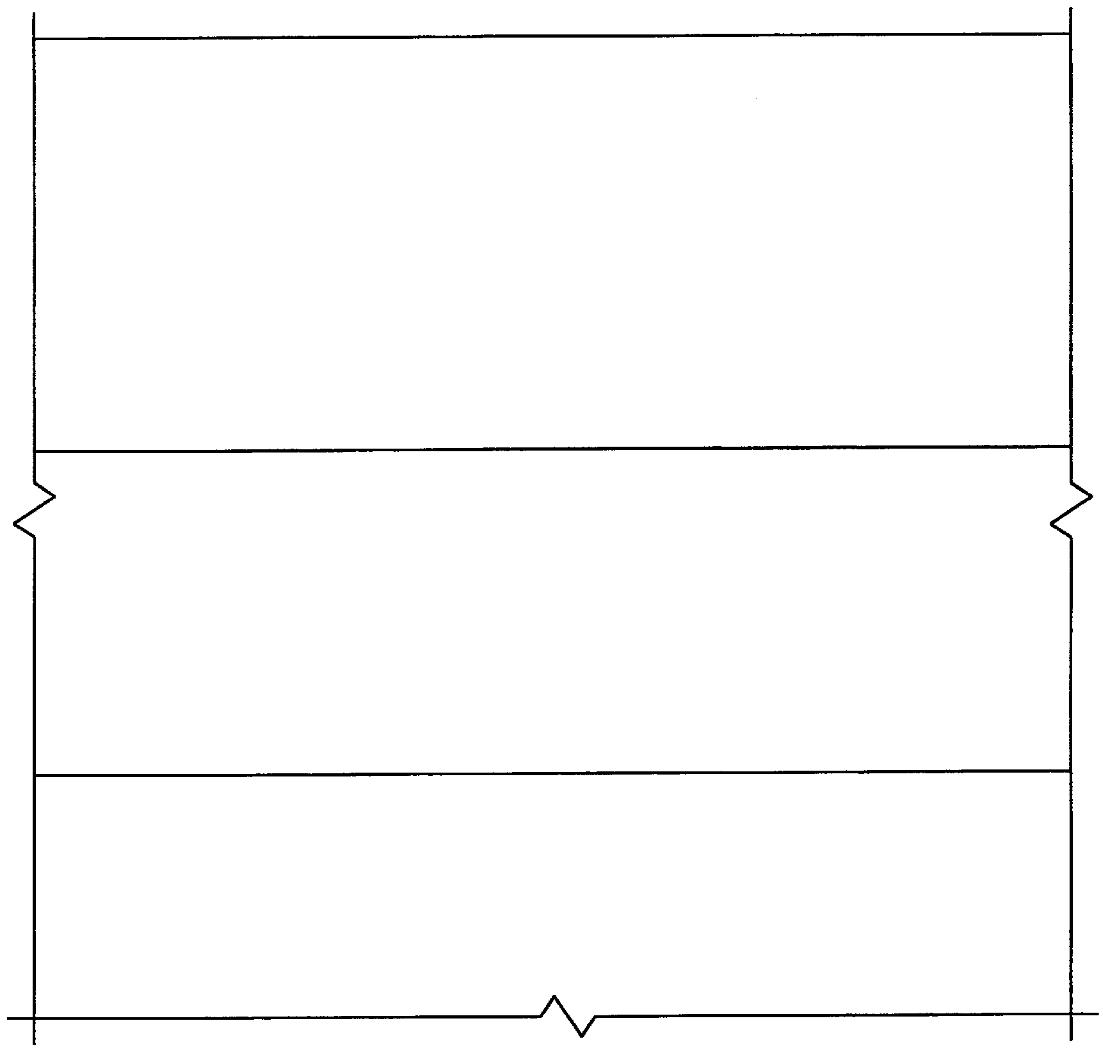
Fig 8.0101AB

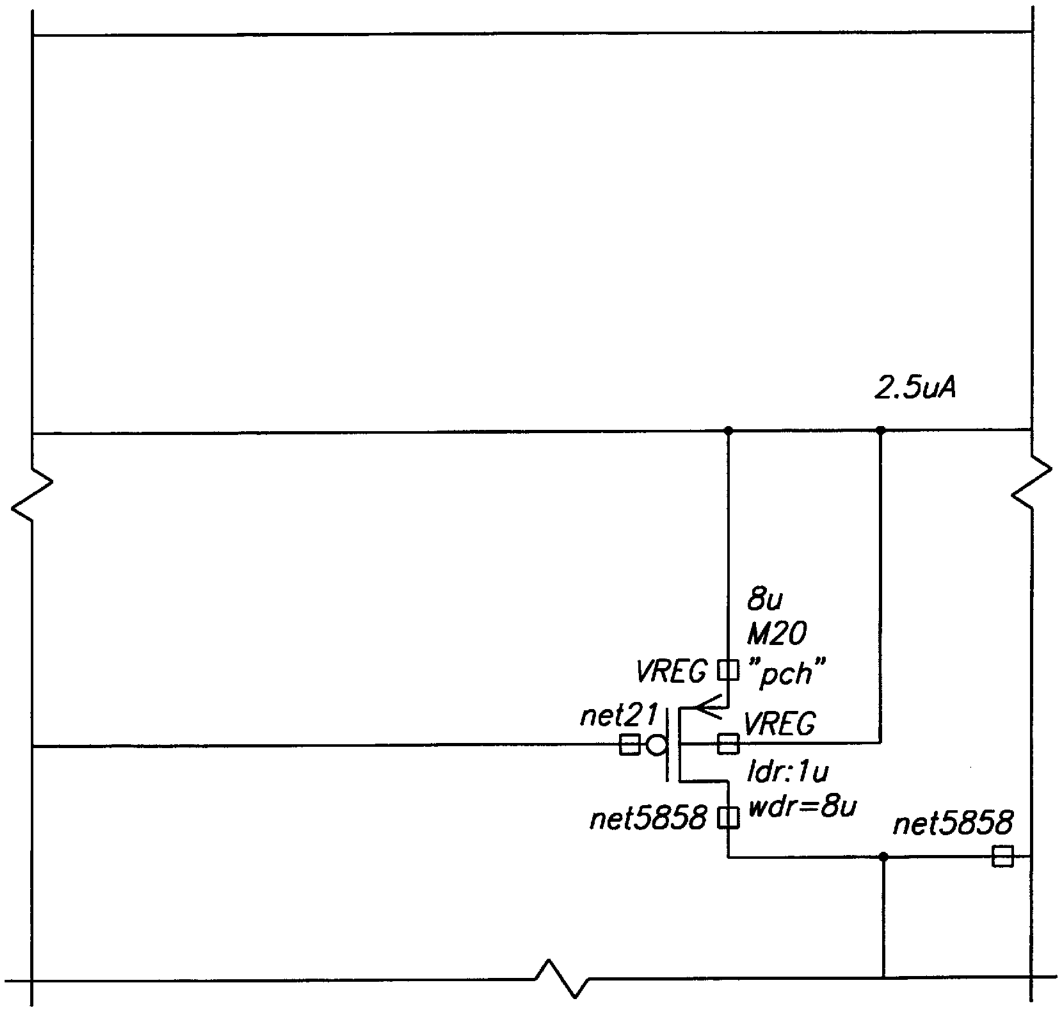
Fig 8.0107AC

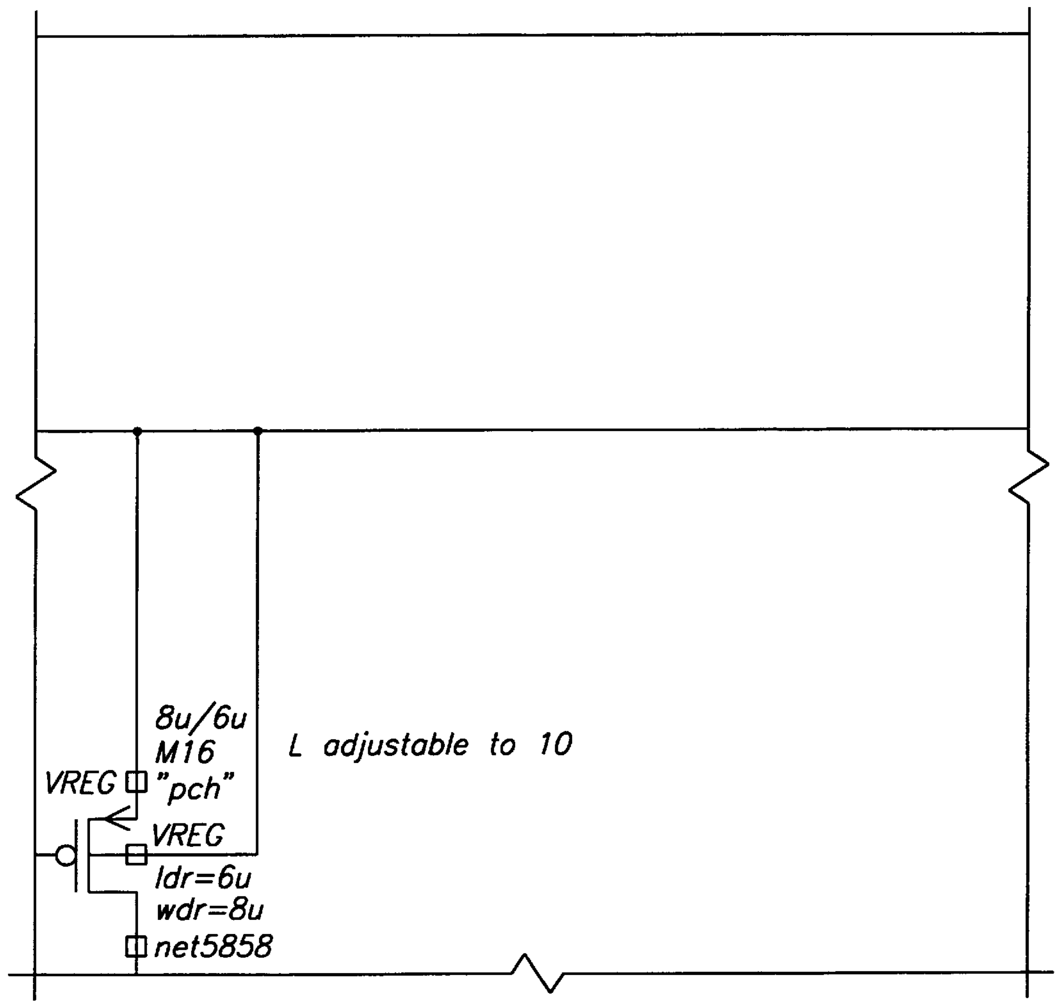
Fig 8.010AD

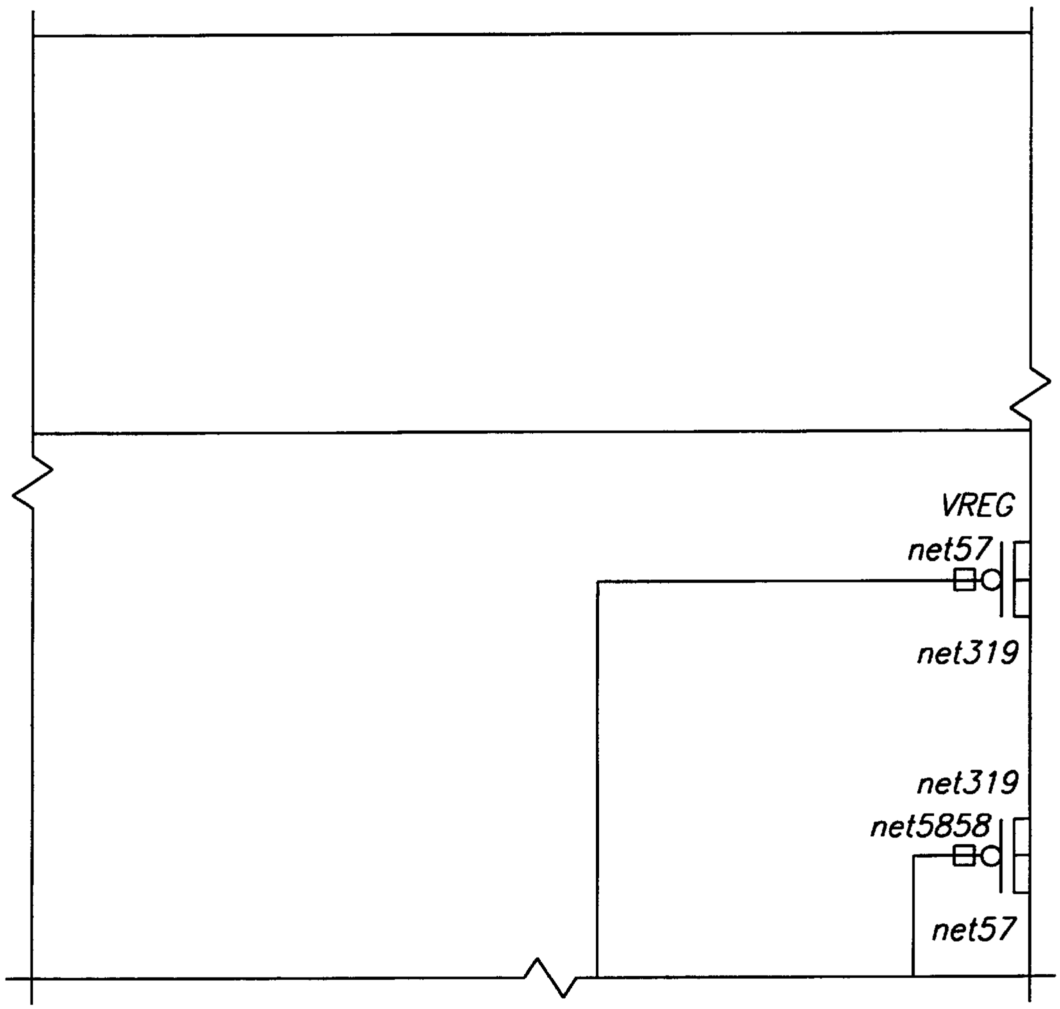
FIG 8.0107AE

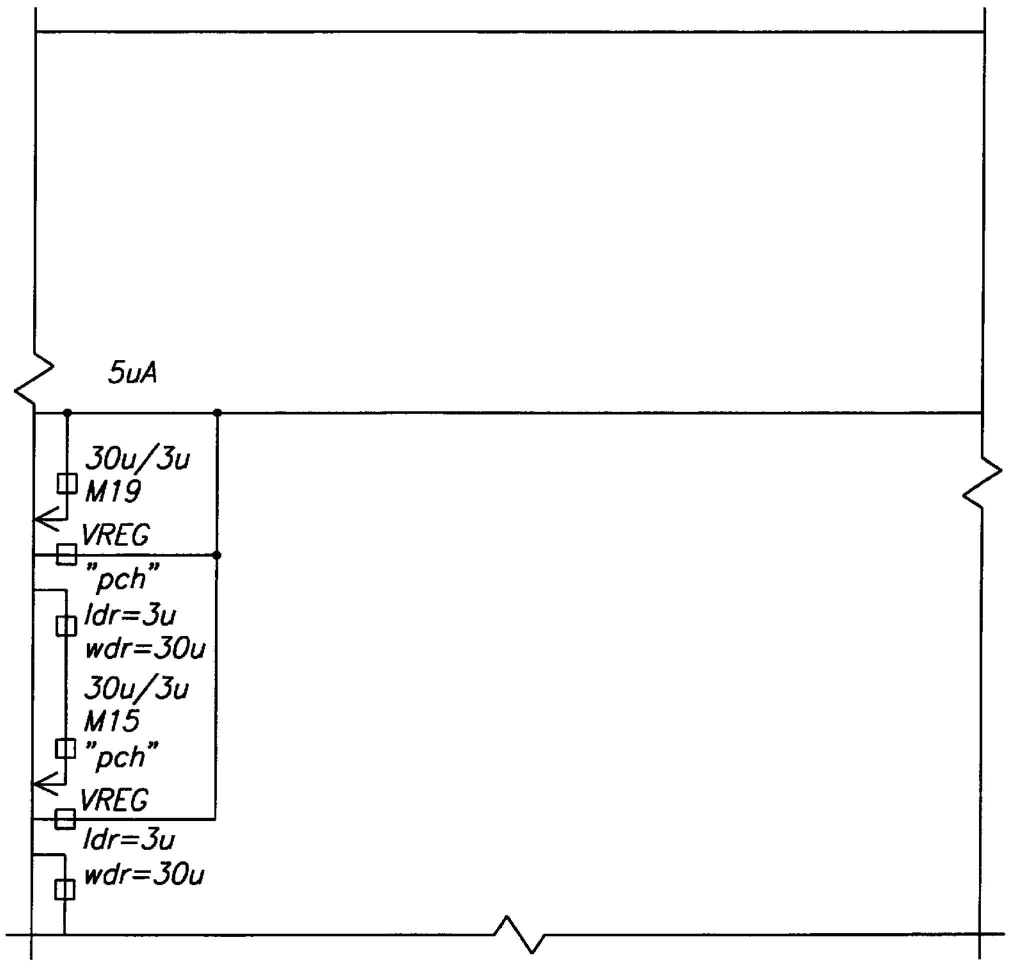
Fig 8.0101AF

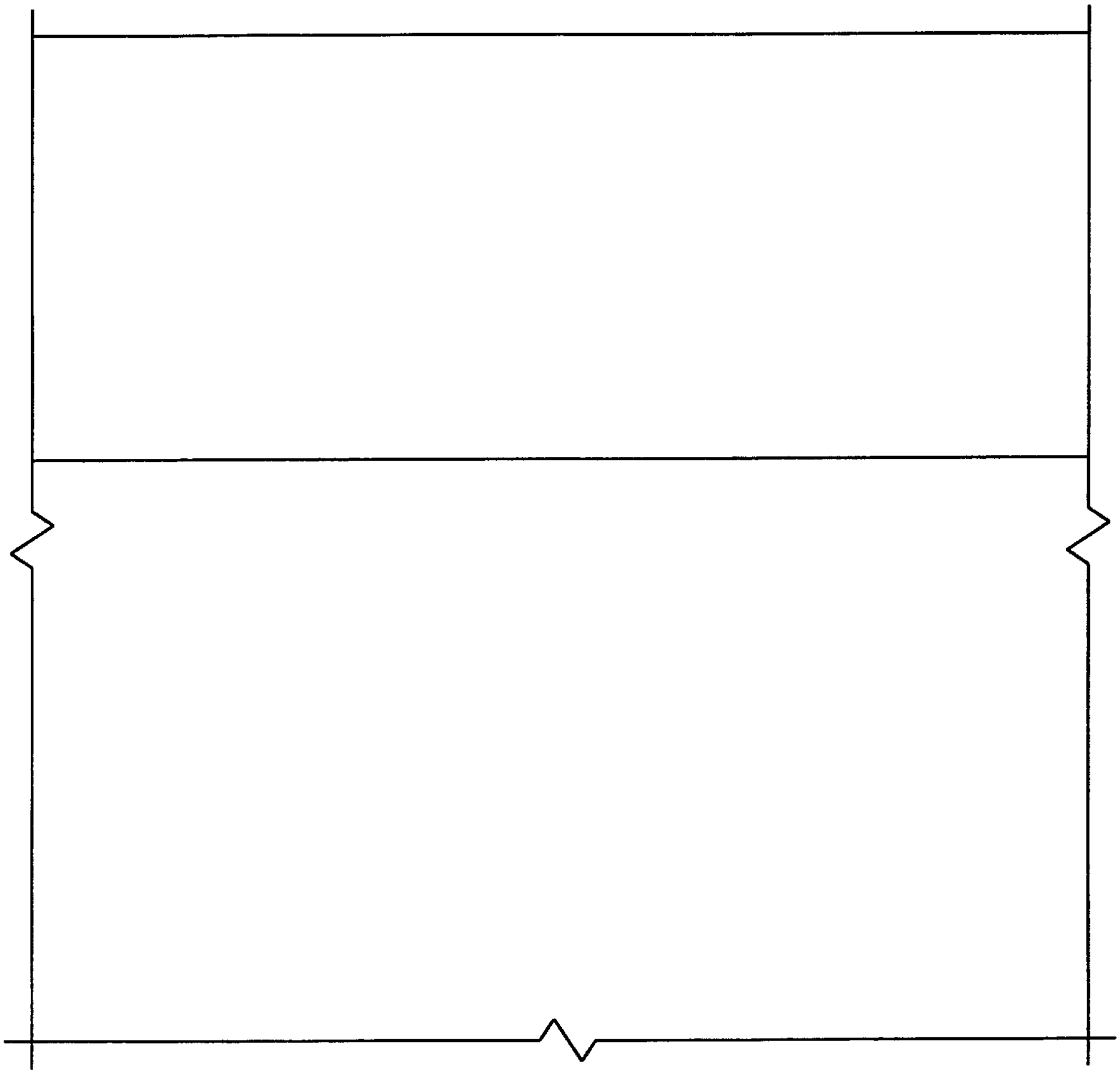
Fig 8.0101AG

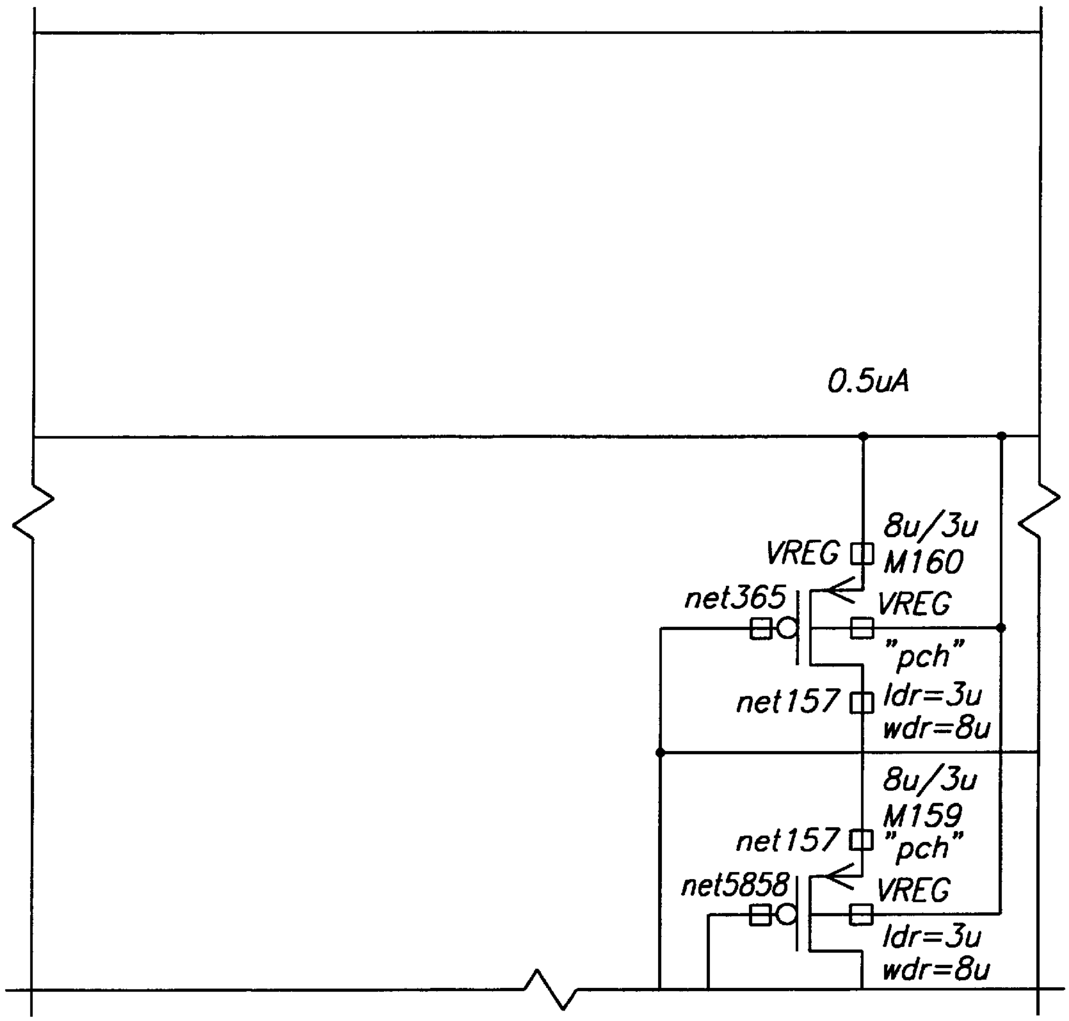
Fig 8.0101AH

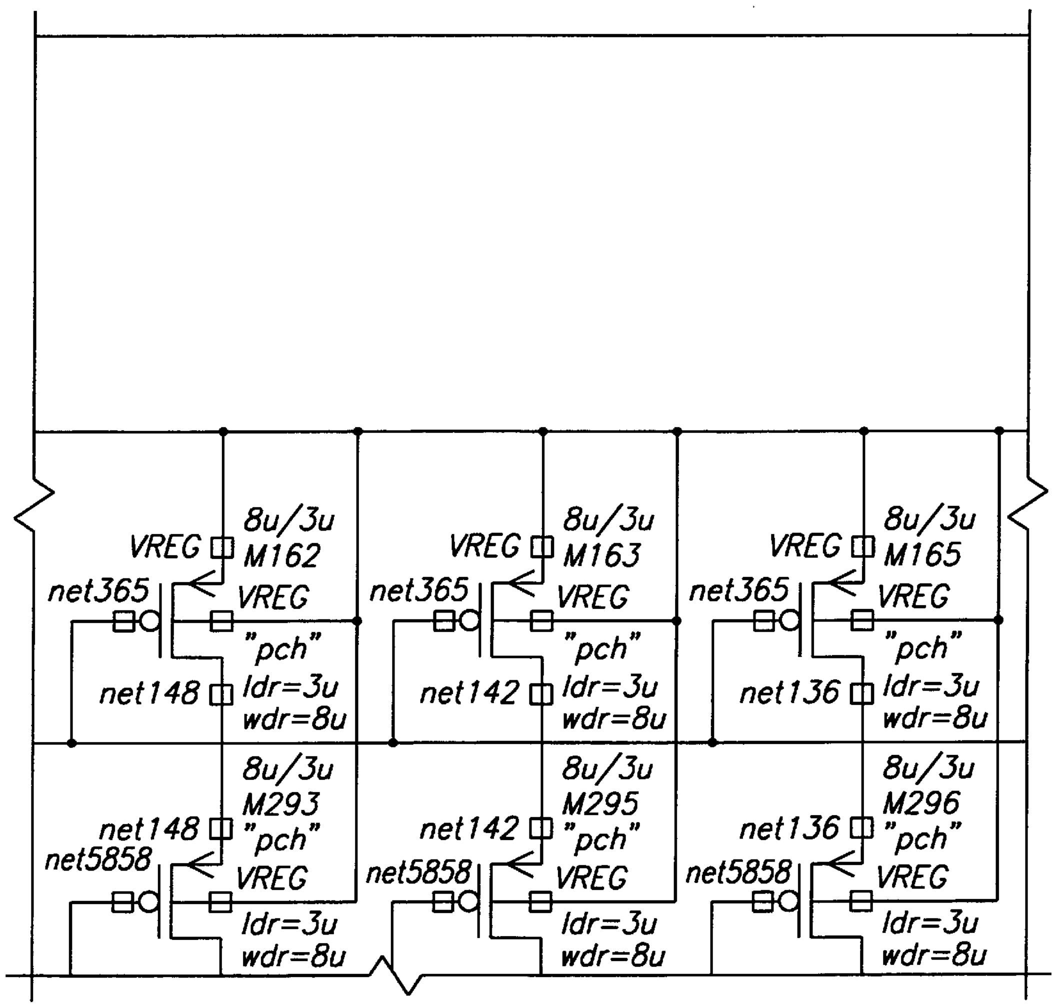
Fig 8.010701

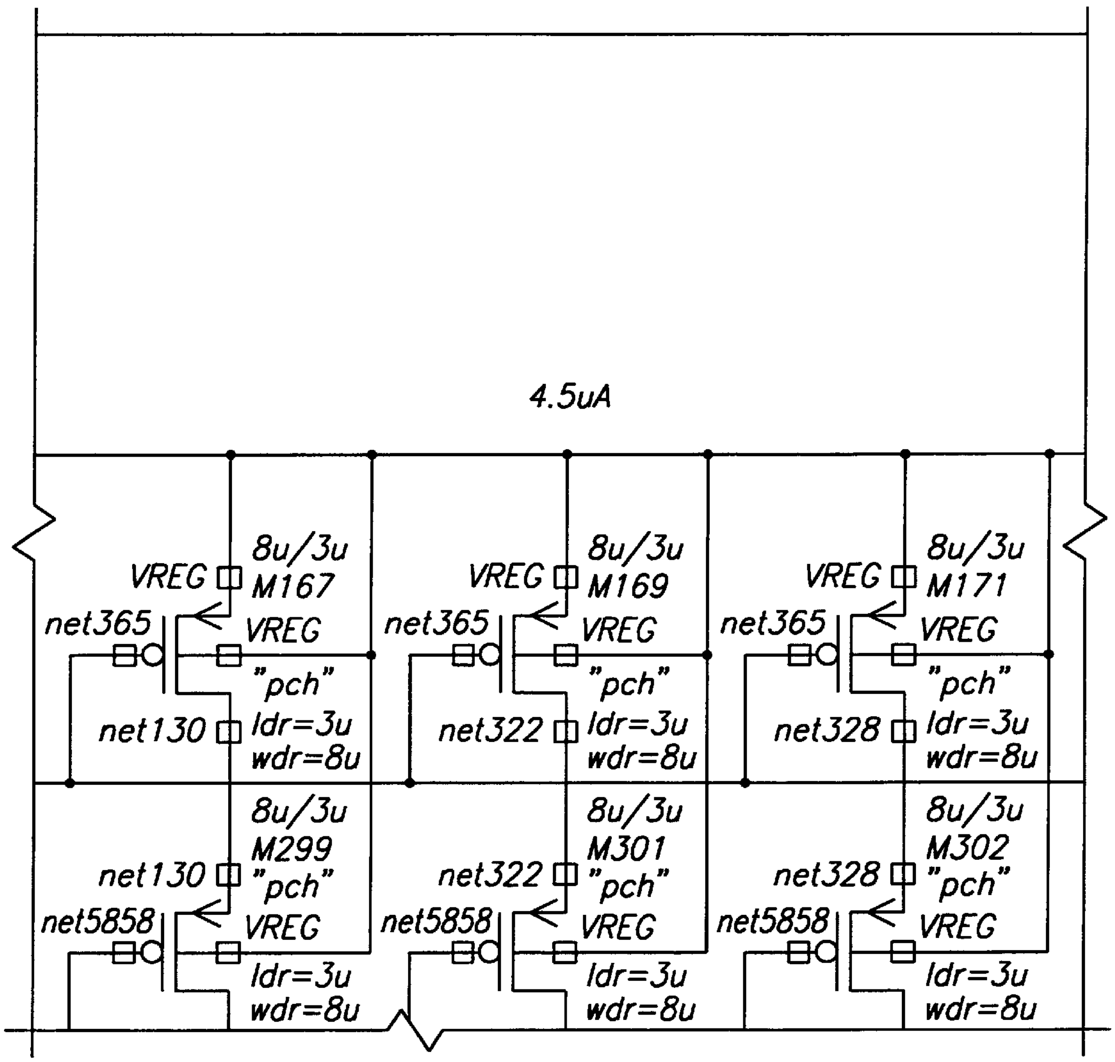
Fig. 8.01071Aa

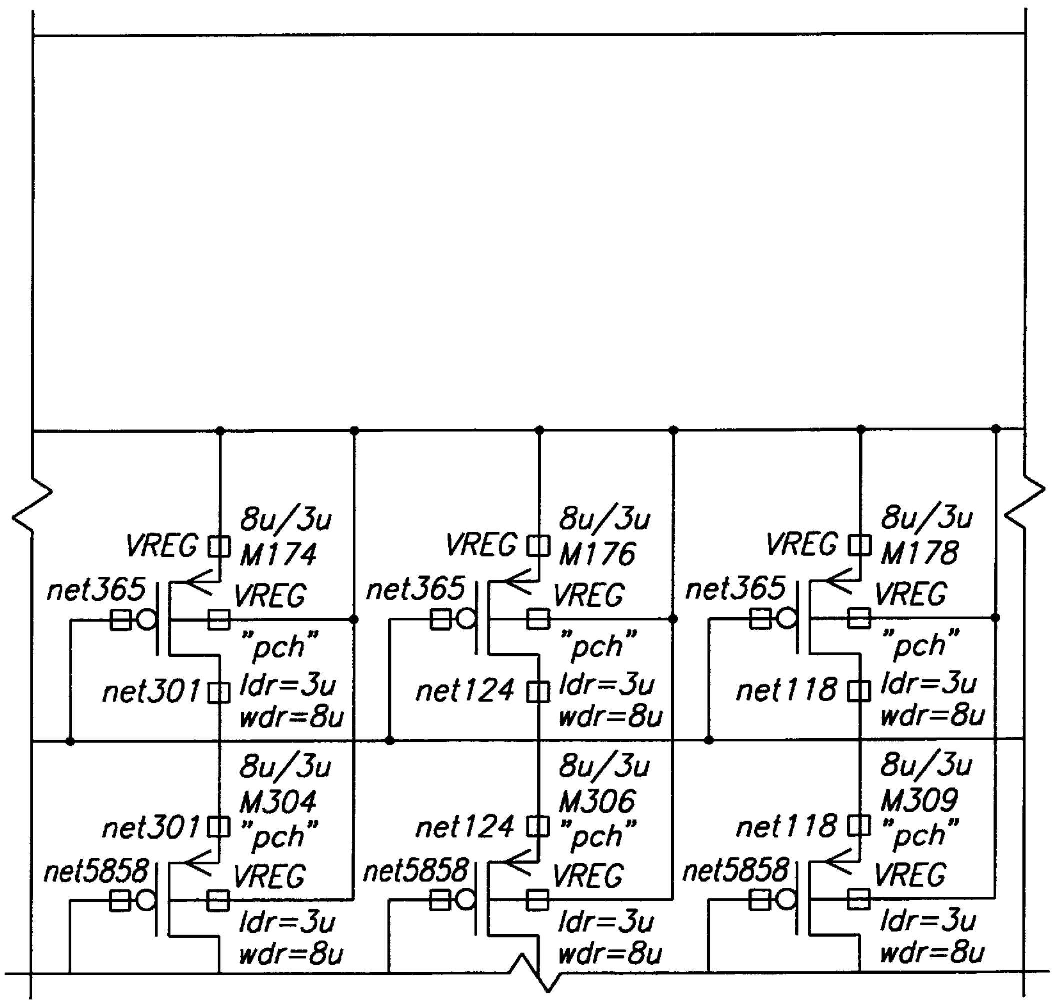
Fig 8.101AK

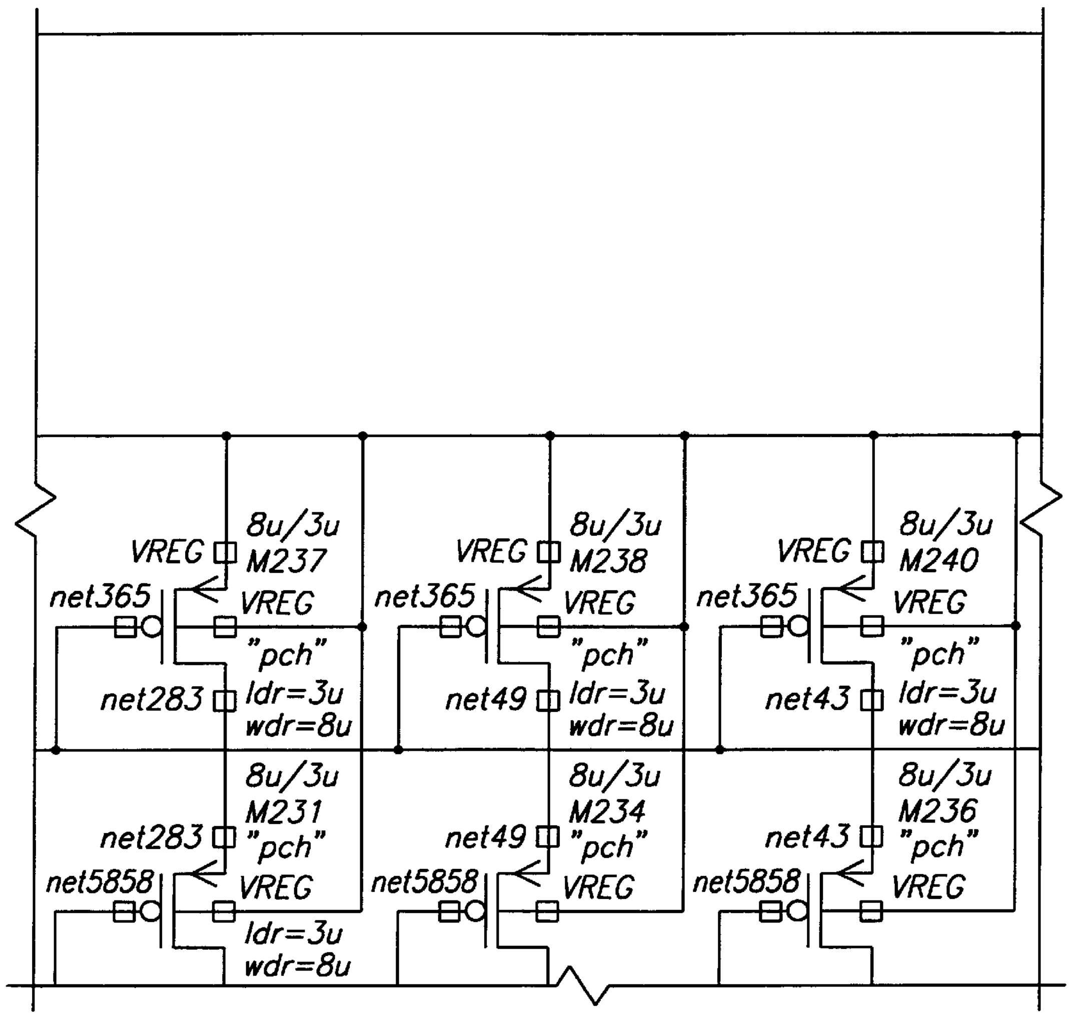
Fig 8.010AL

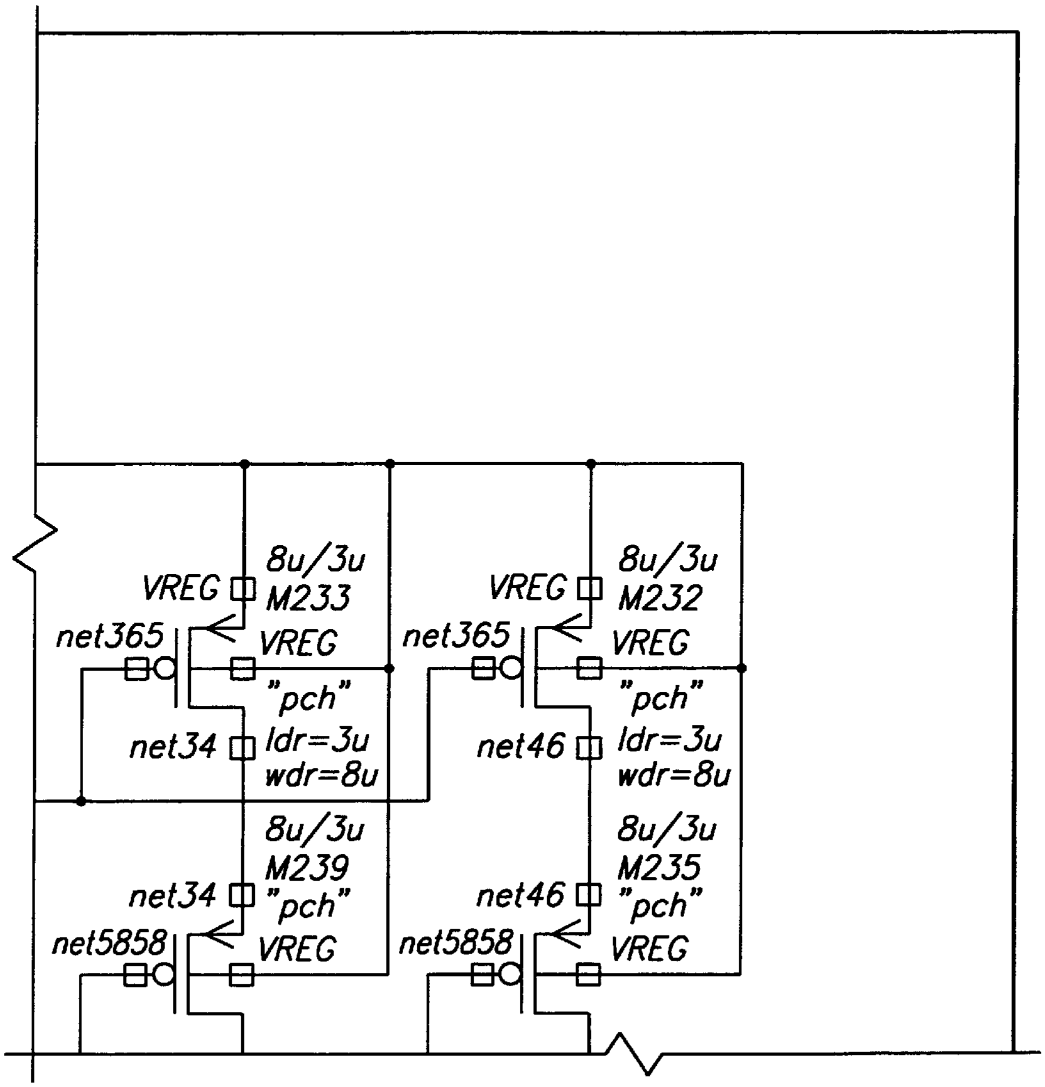
Fig 8.0101AM

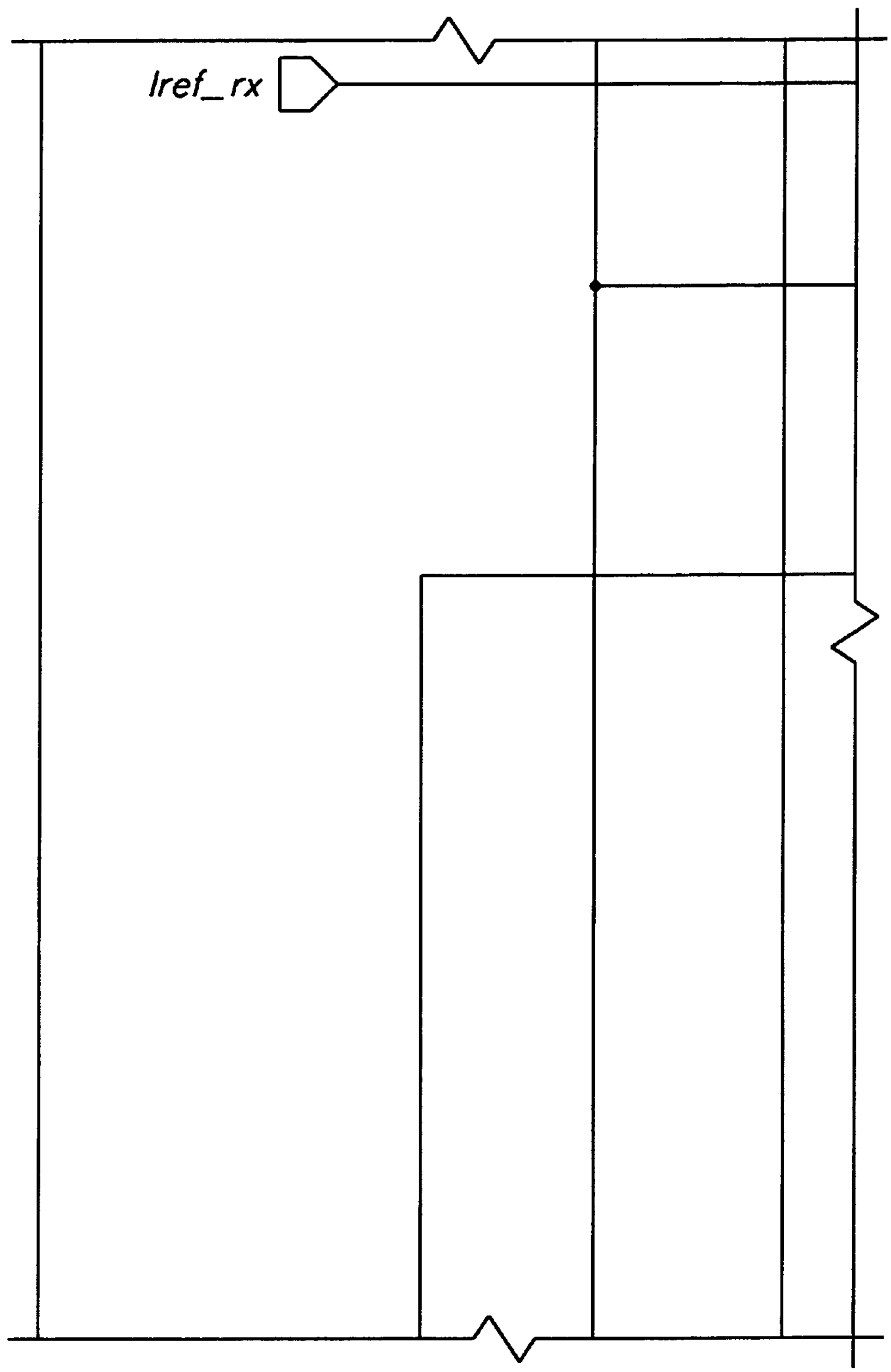
FIG 8.0107BA

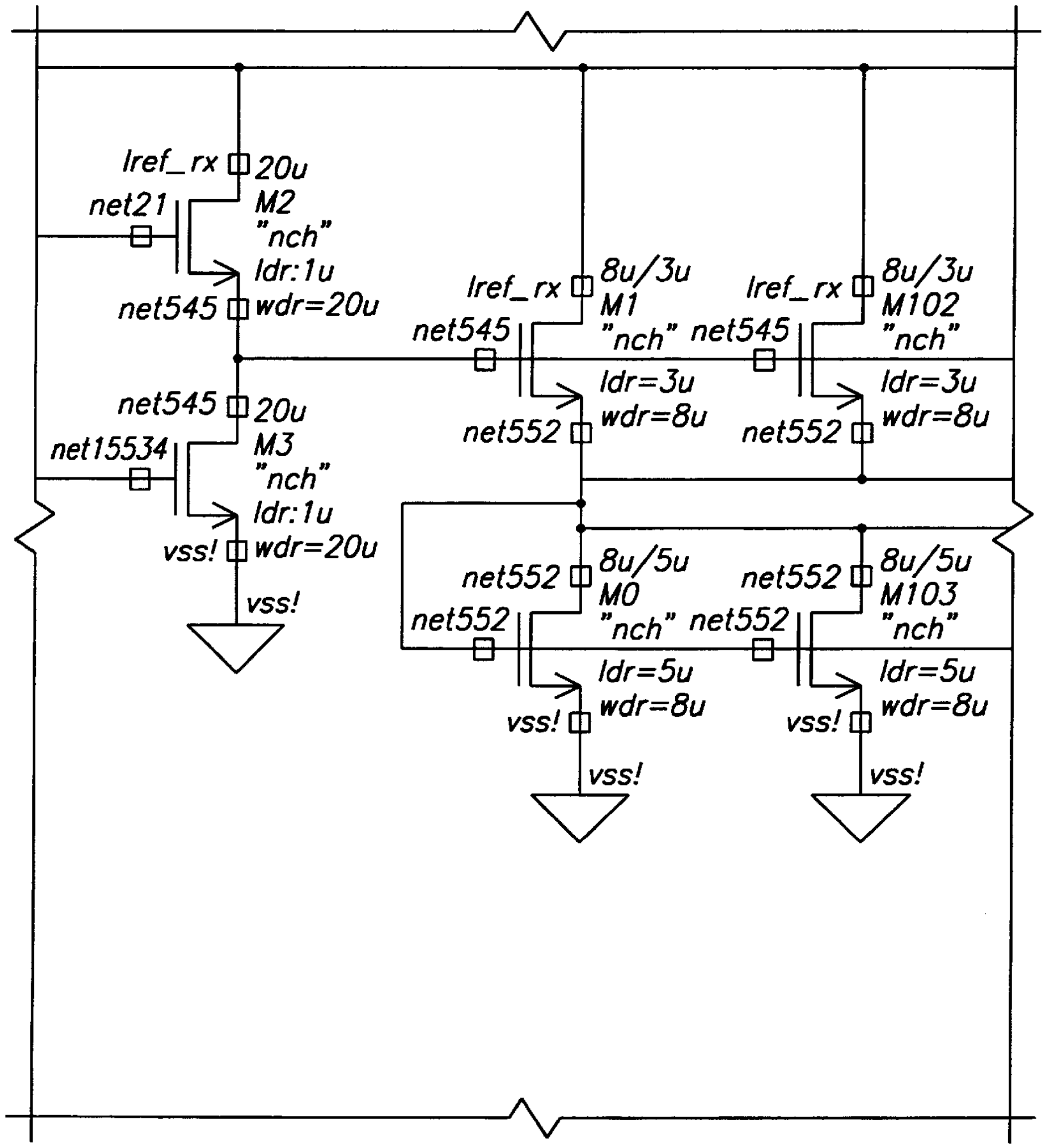
Fig 8.0107BB

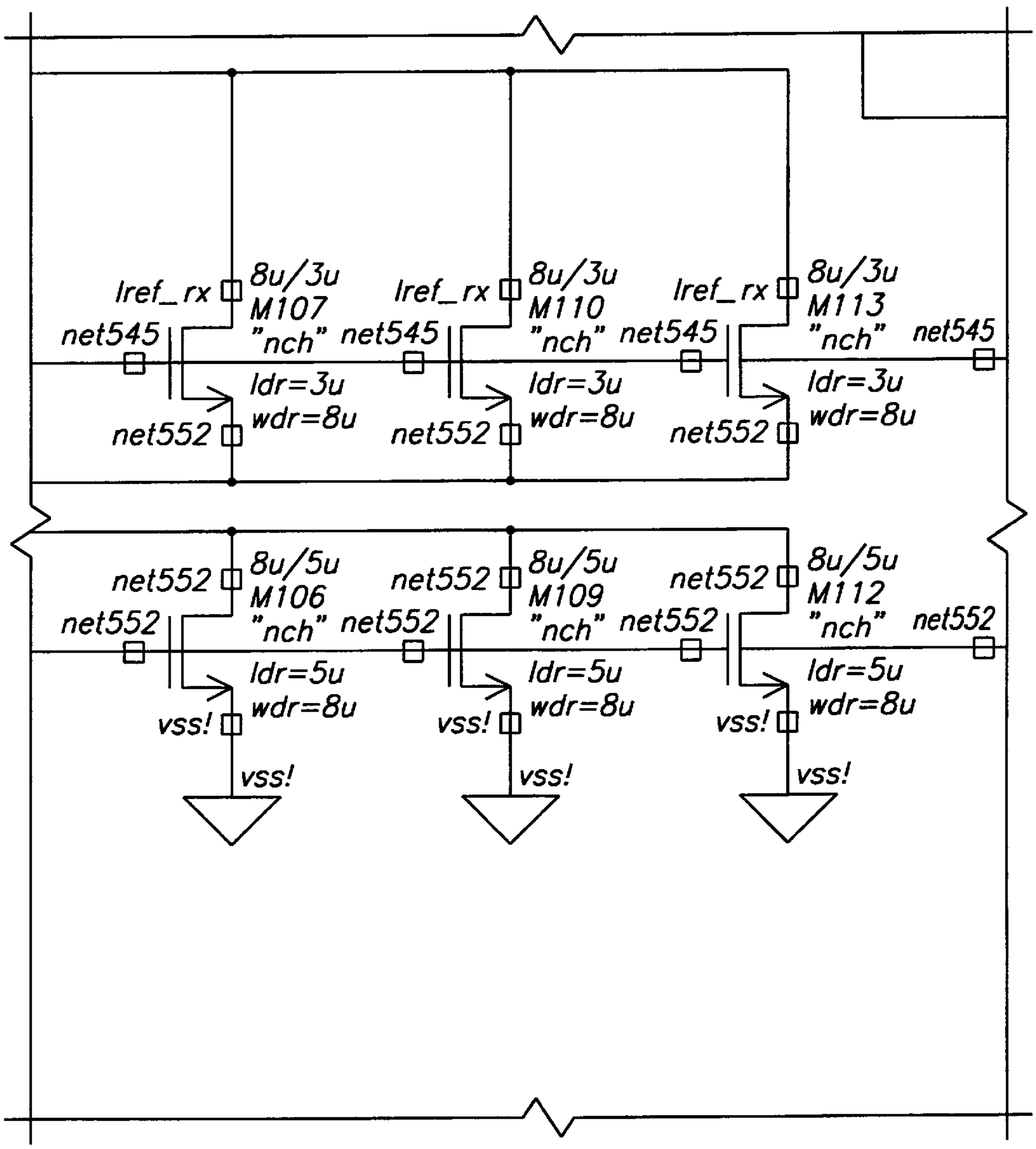
Fig 8.0107BC

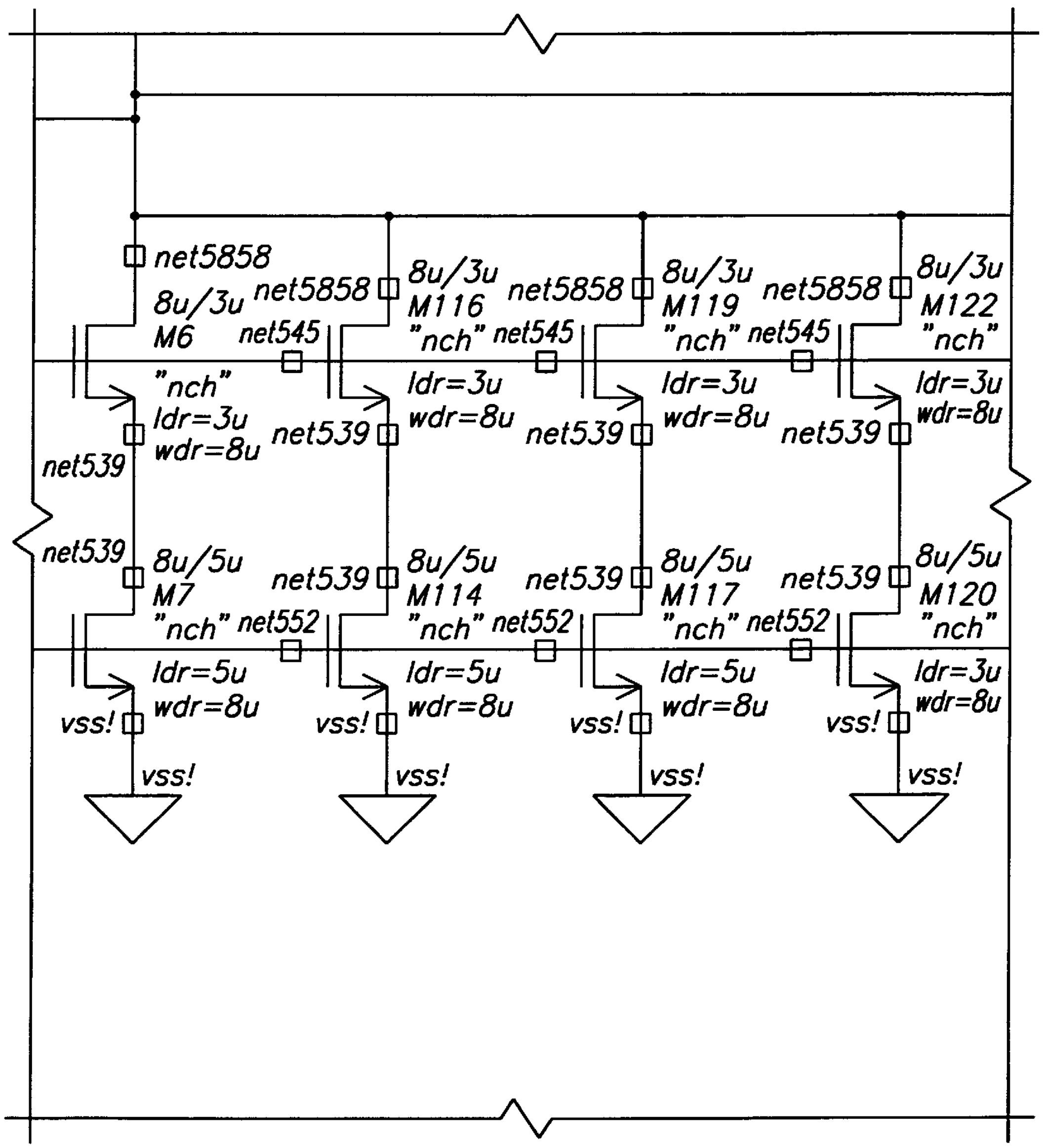
Fig 8.0107BD

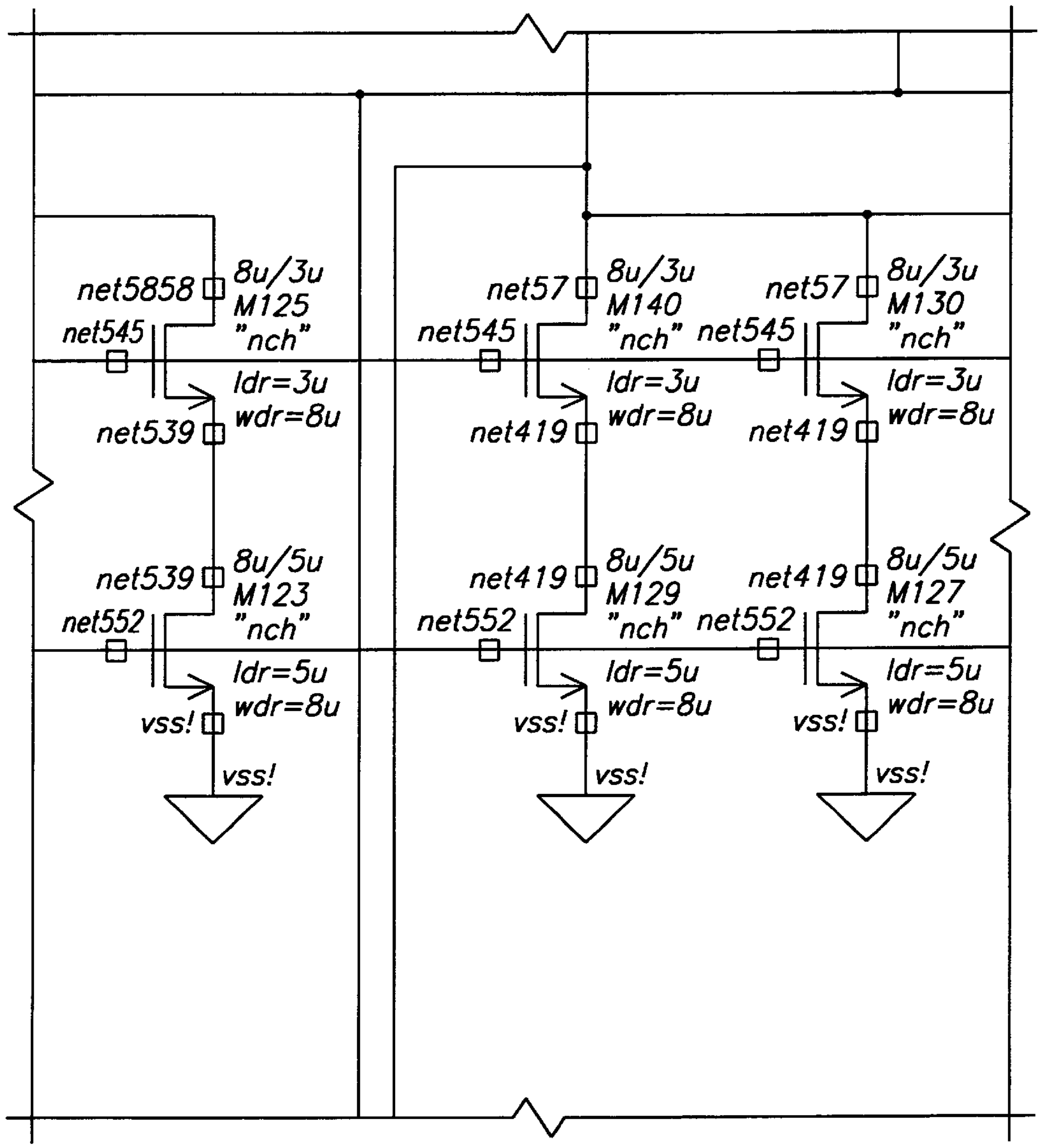
Fig 8.0101BE

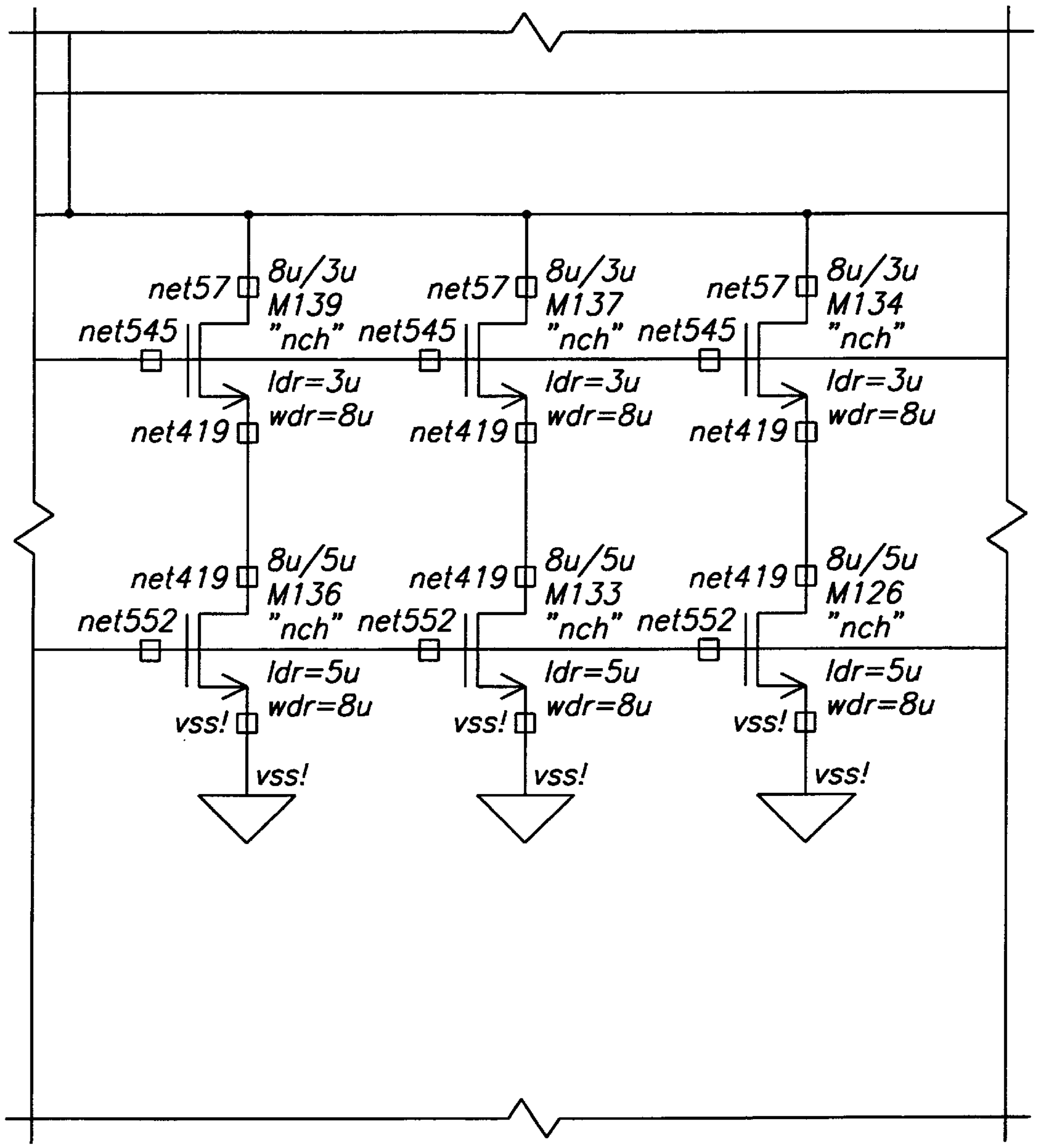
Fig 8.0101BF

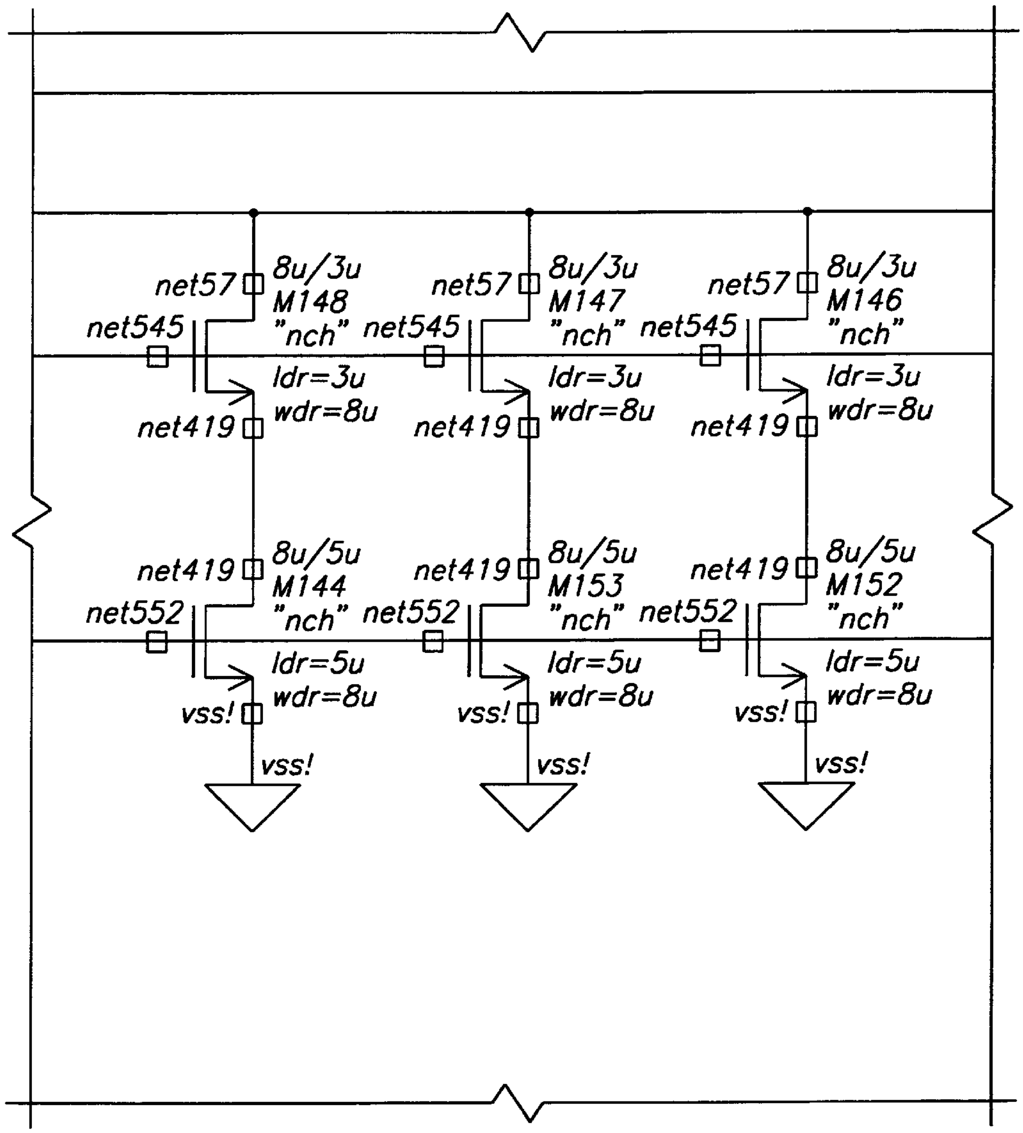
Fig 8.0107BG

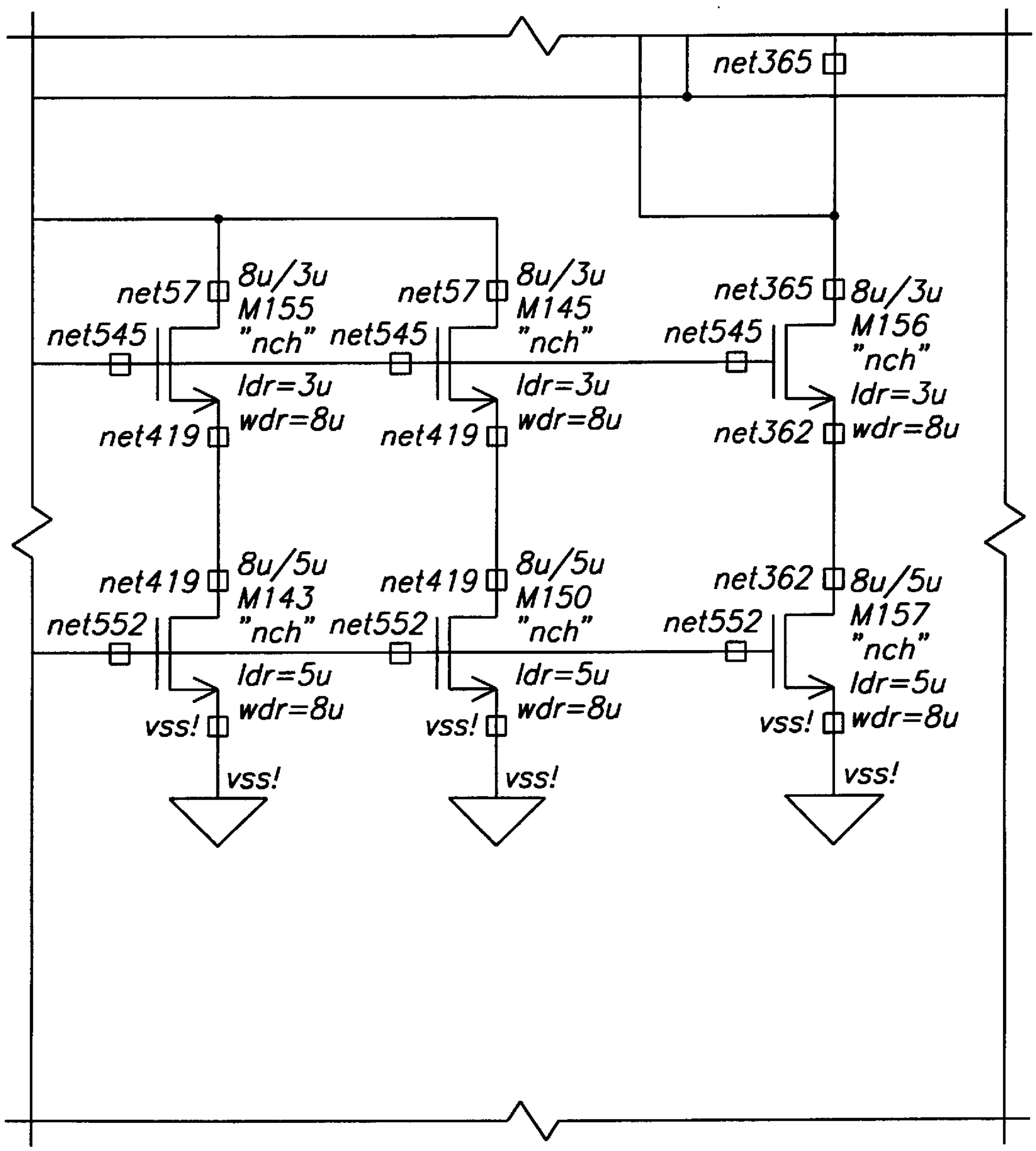
Fig. 8.0101BH

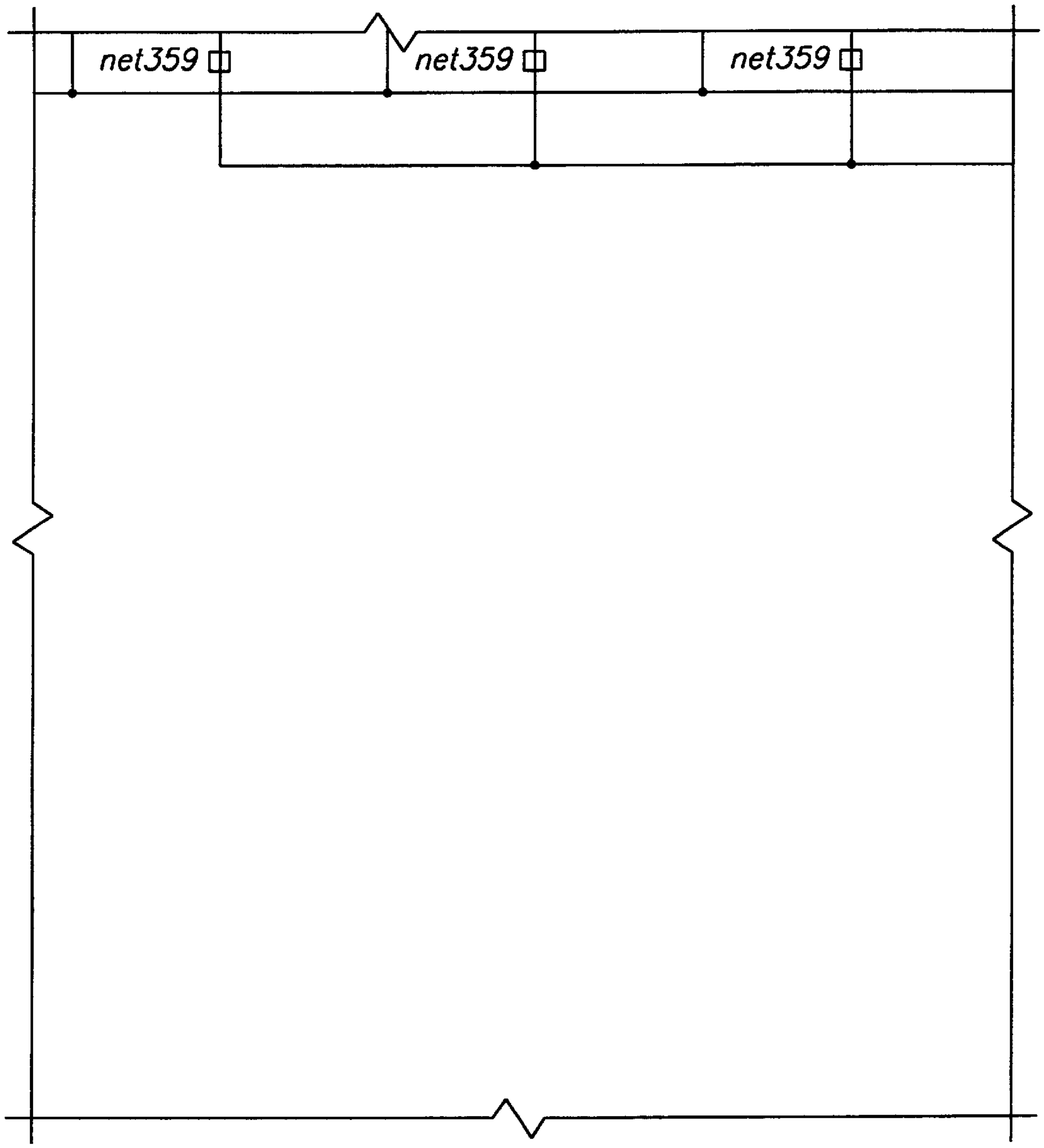
Fig 8.0107B1

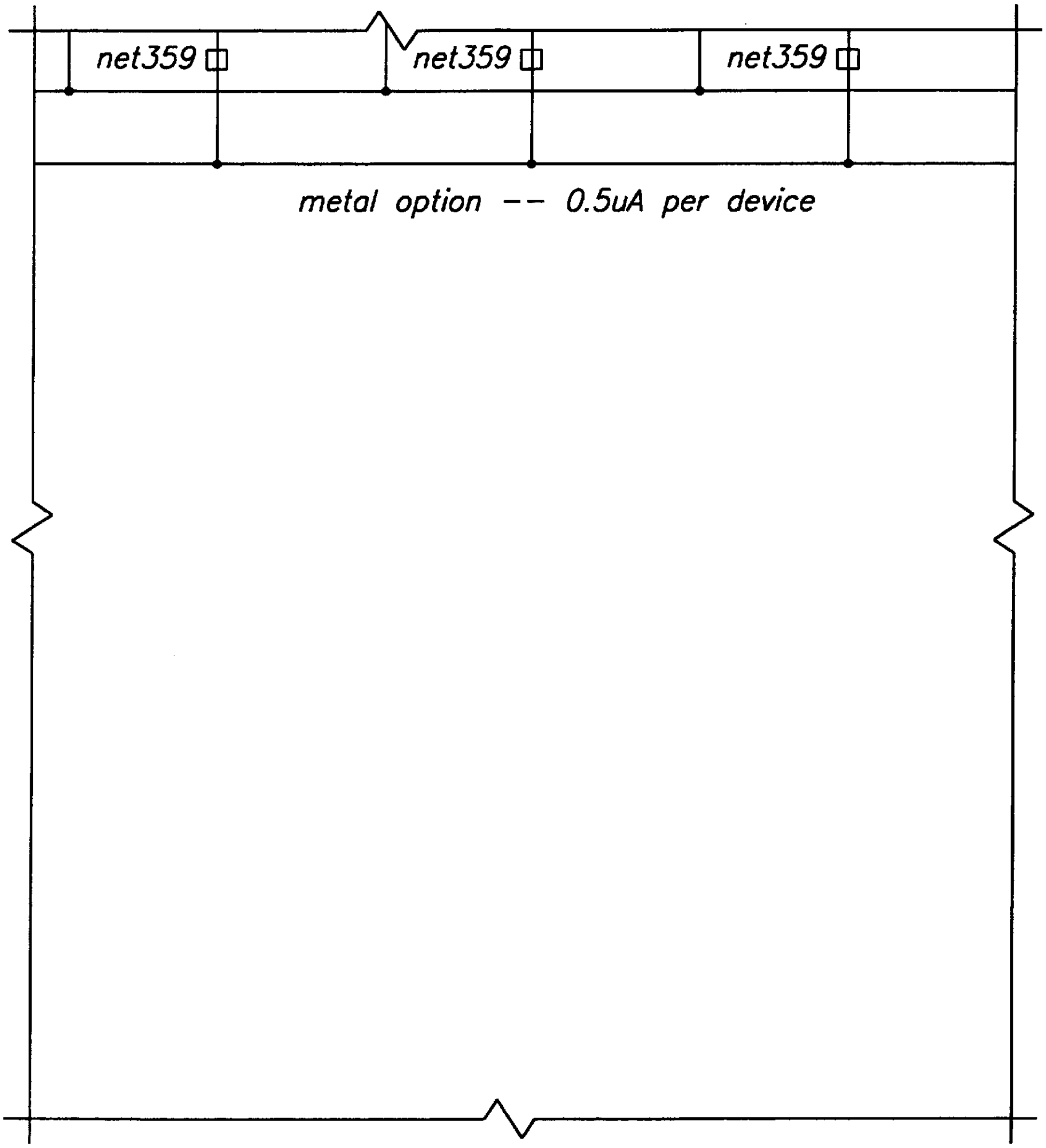
Fig. 8.0107B.J

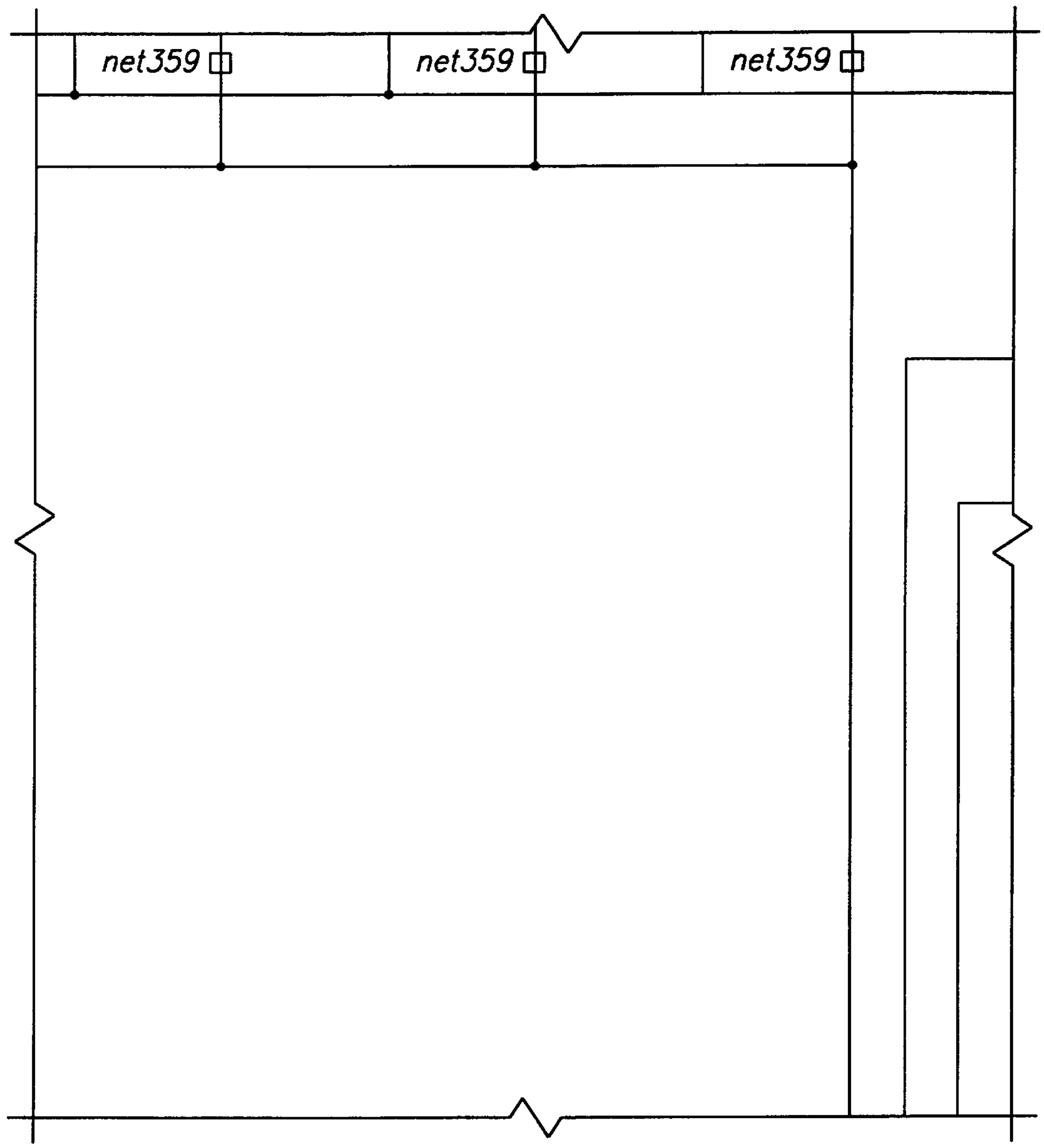
Fig 8.0107BK

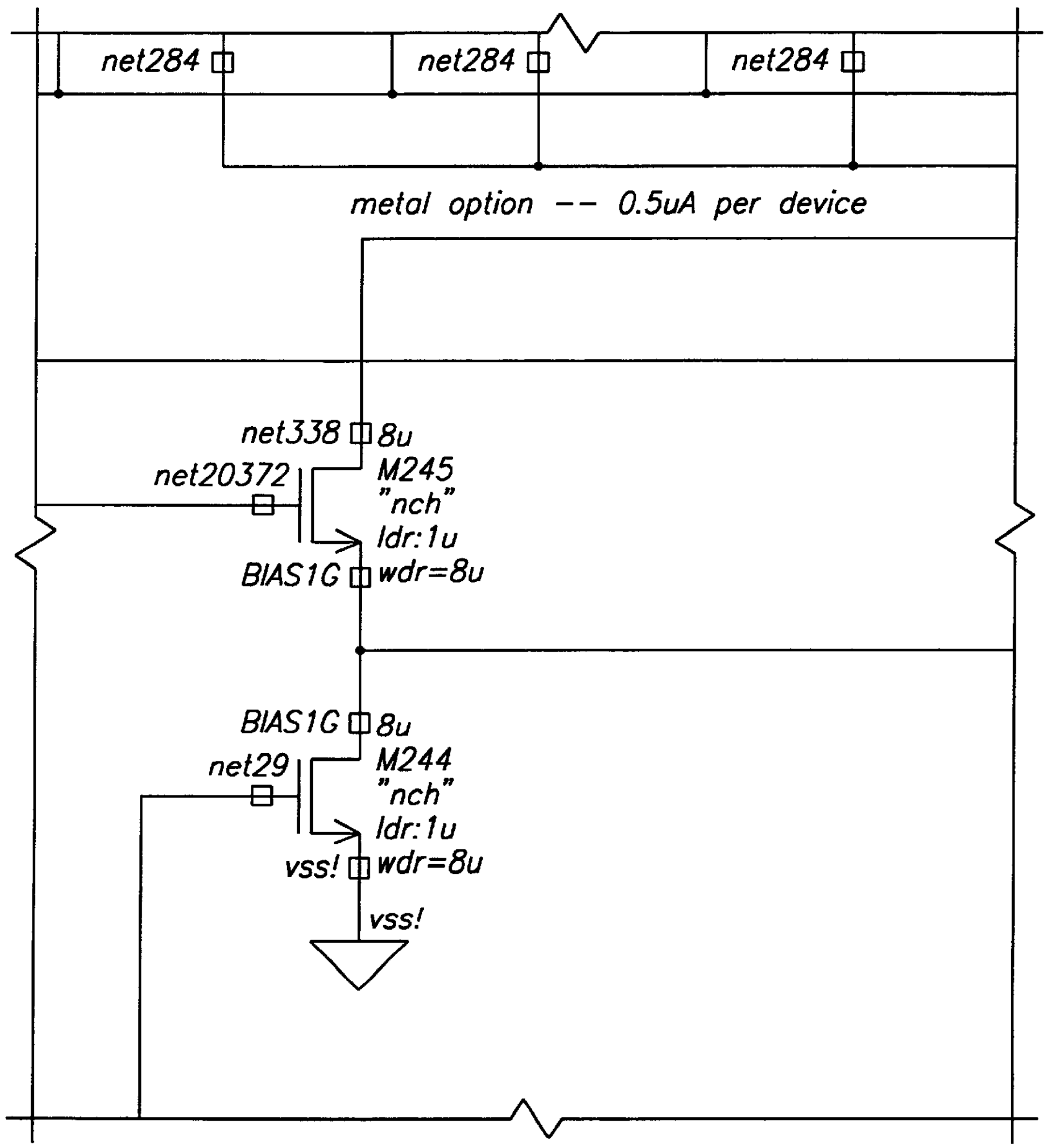
Fig 8.0107BL

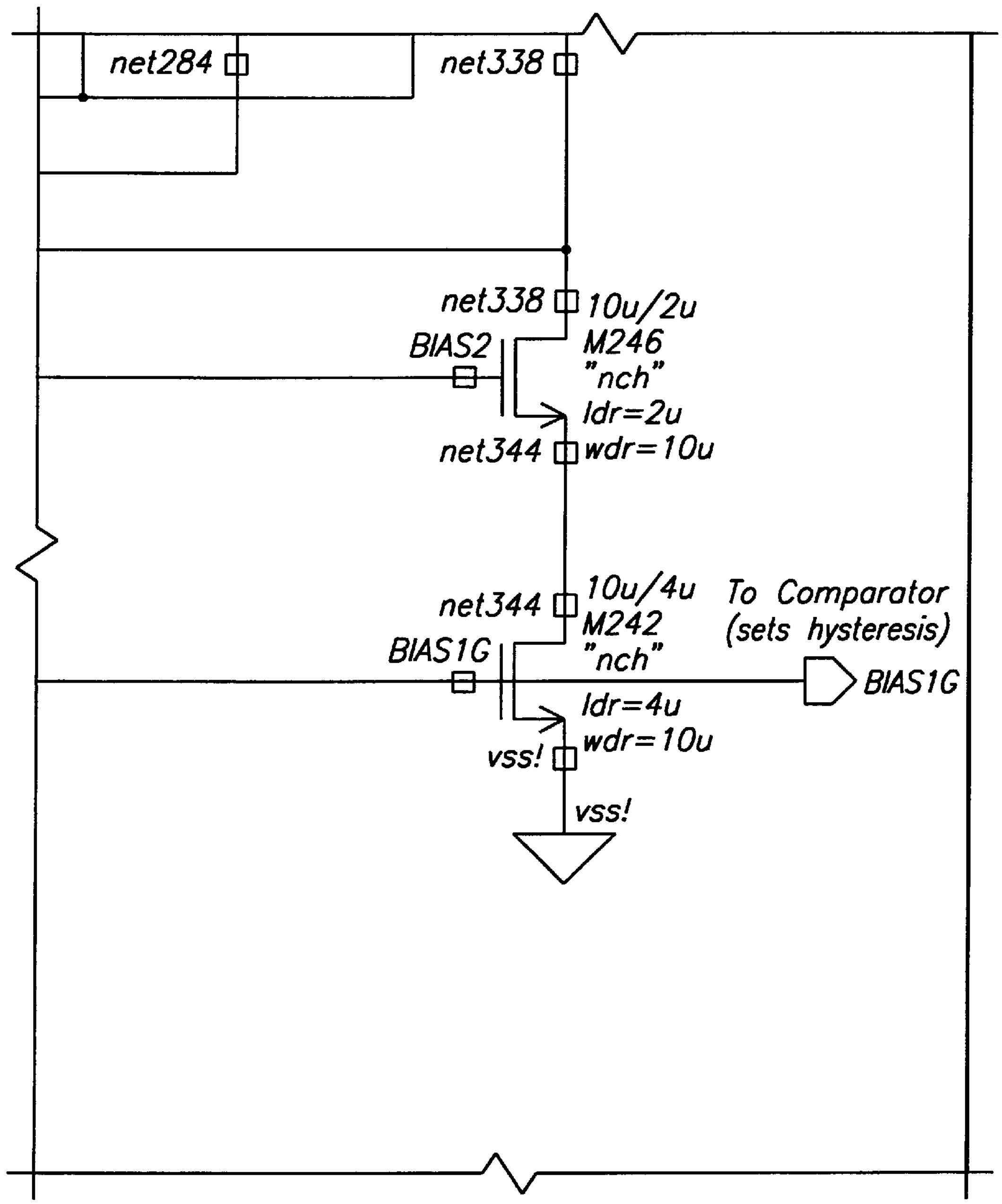
Fig 8.010.1BM

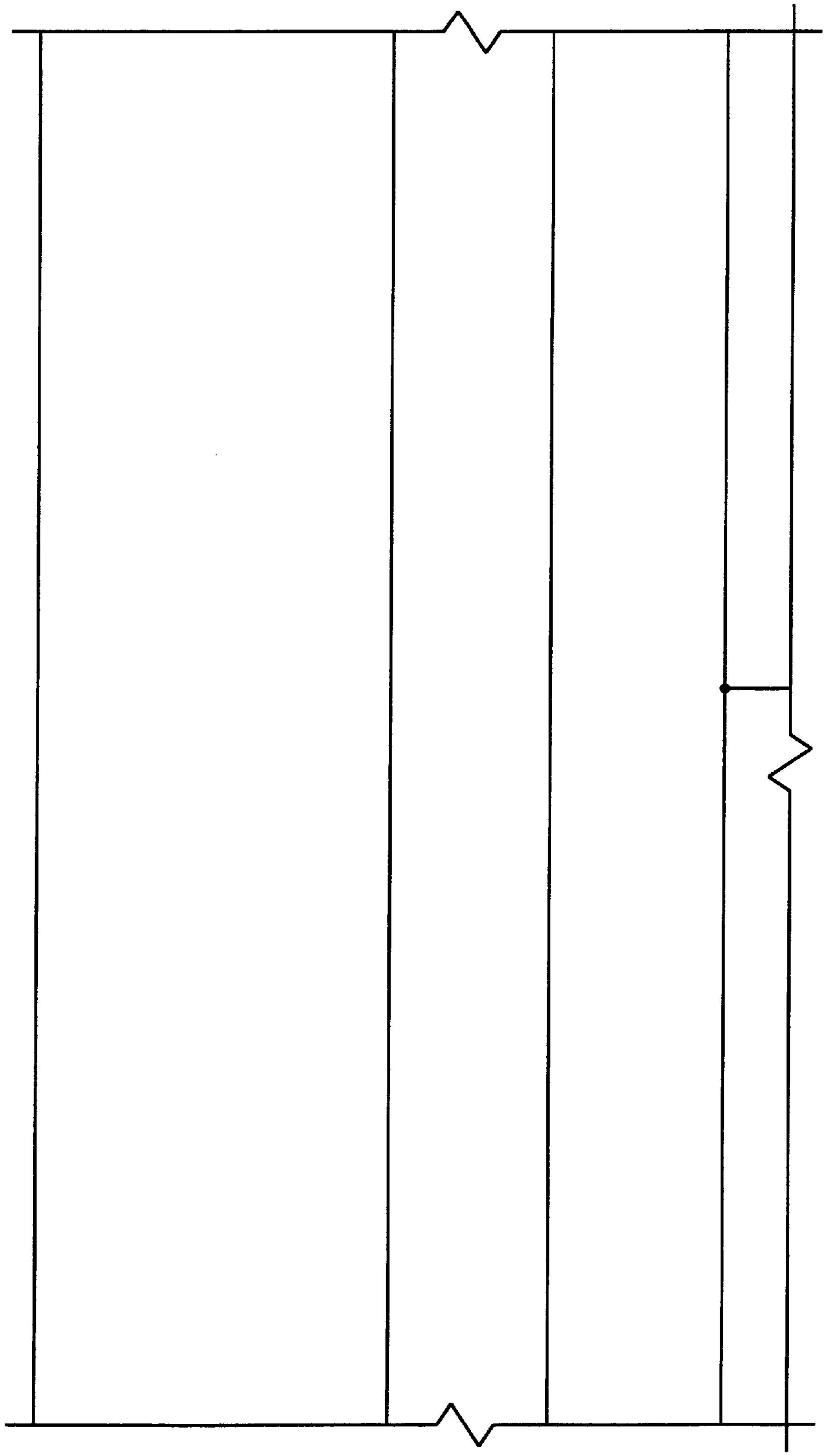
Fig 8.0101CA

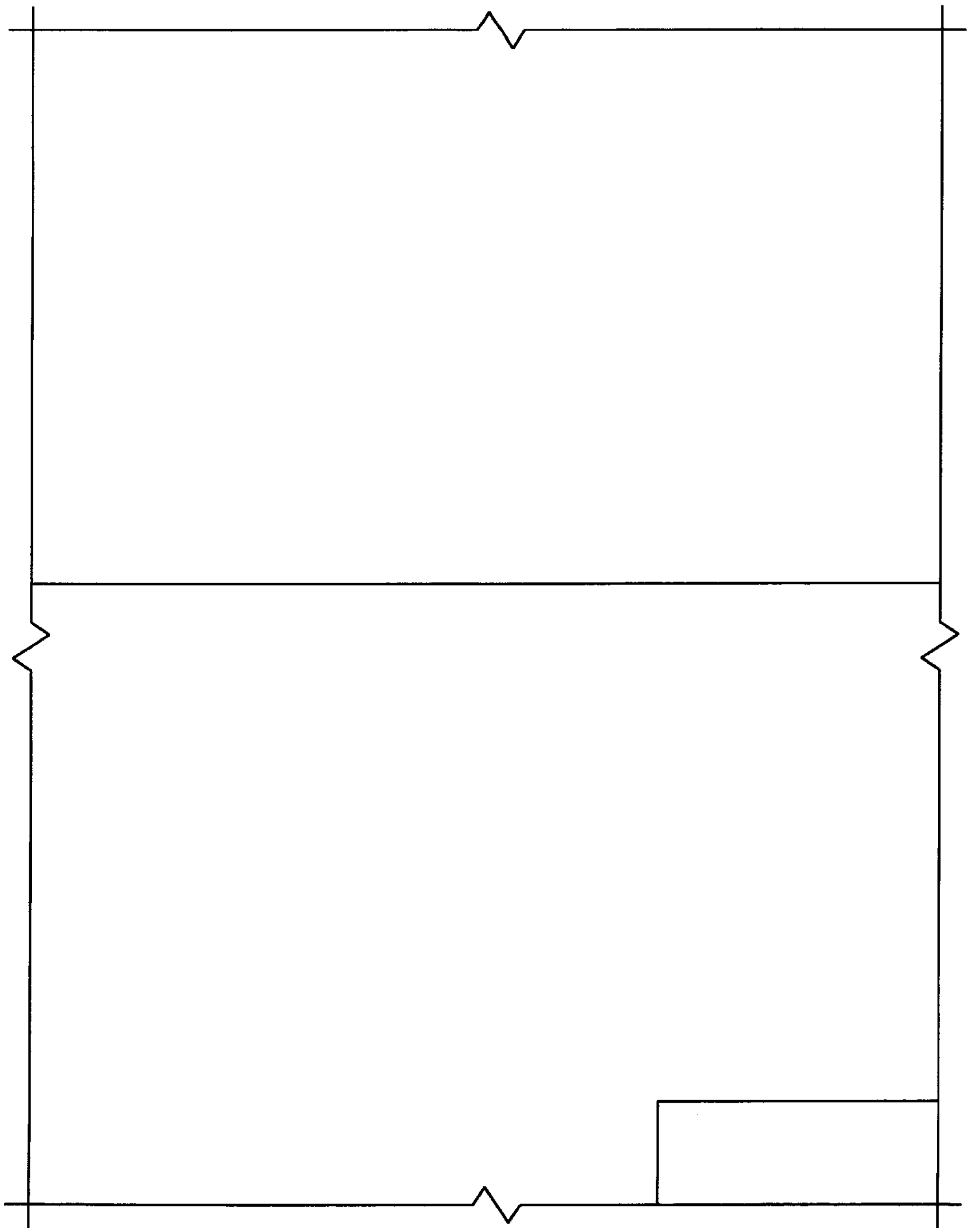
Fig. 8.0107CB

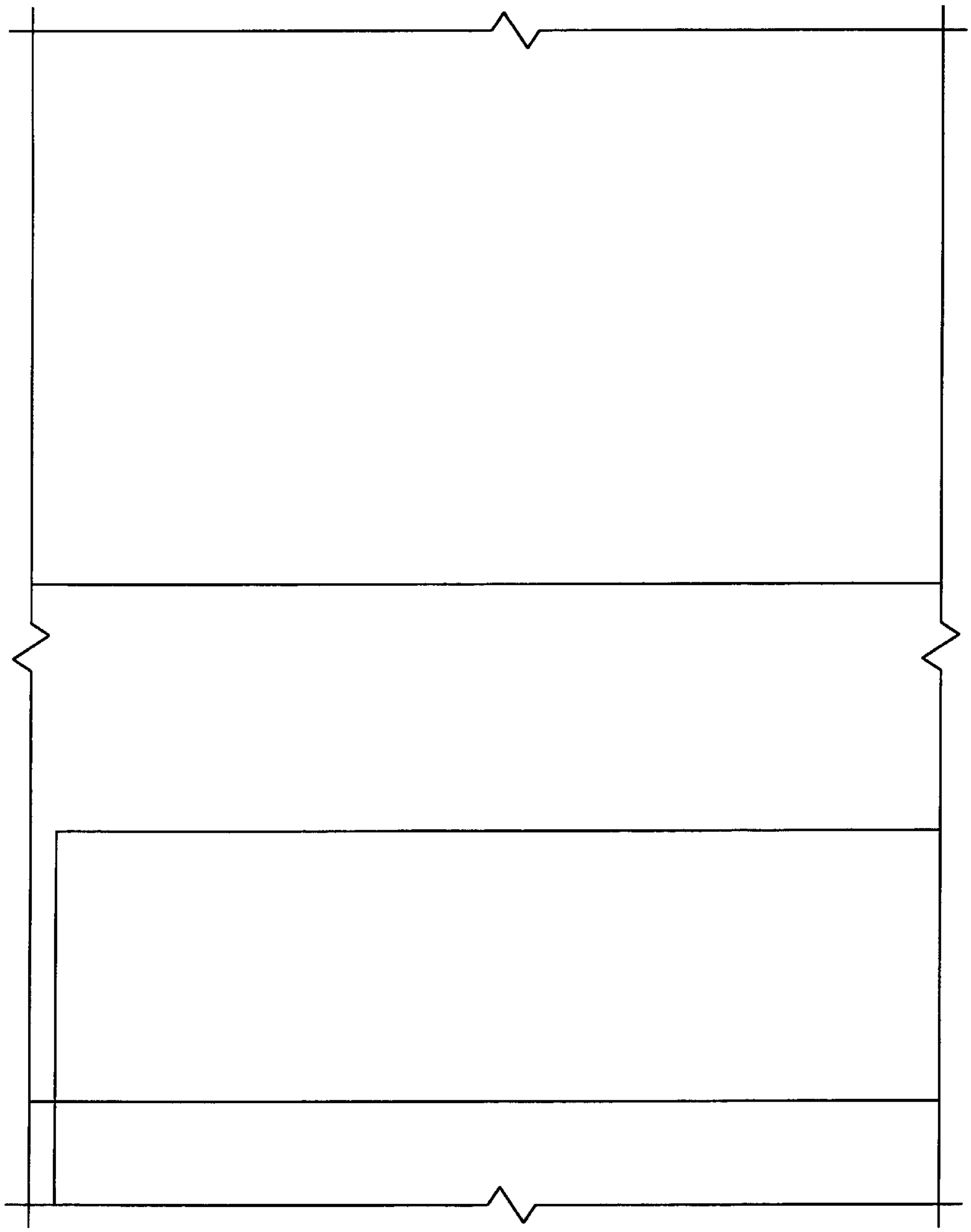
Fig 8.0107CC

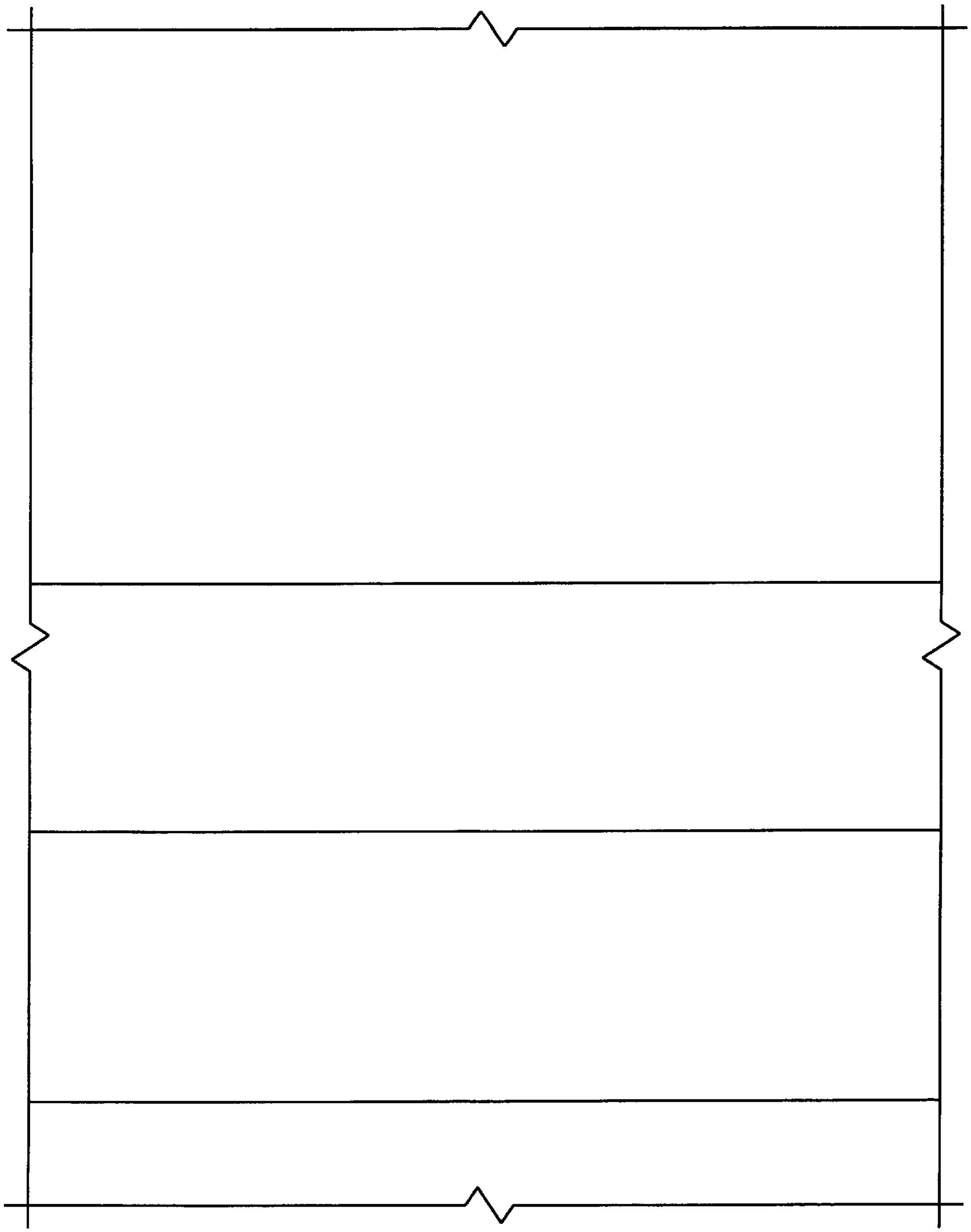
Fig 8.0107CD

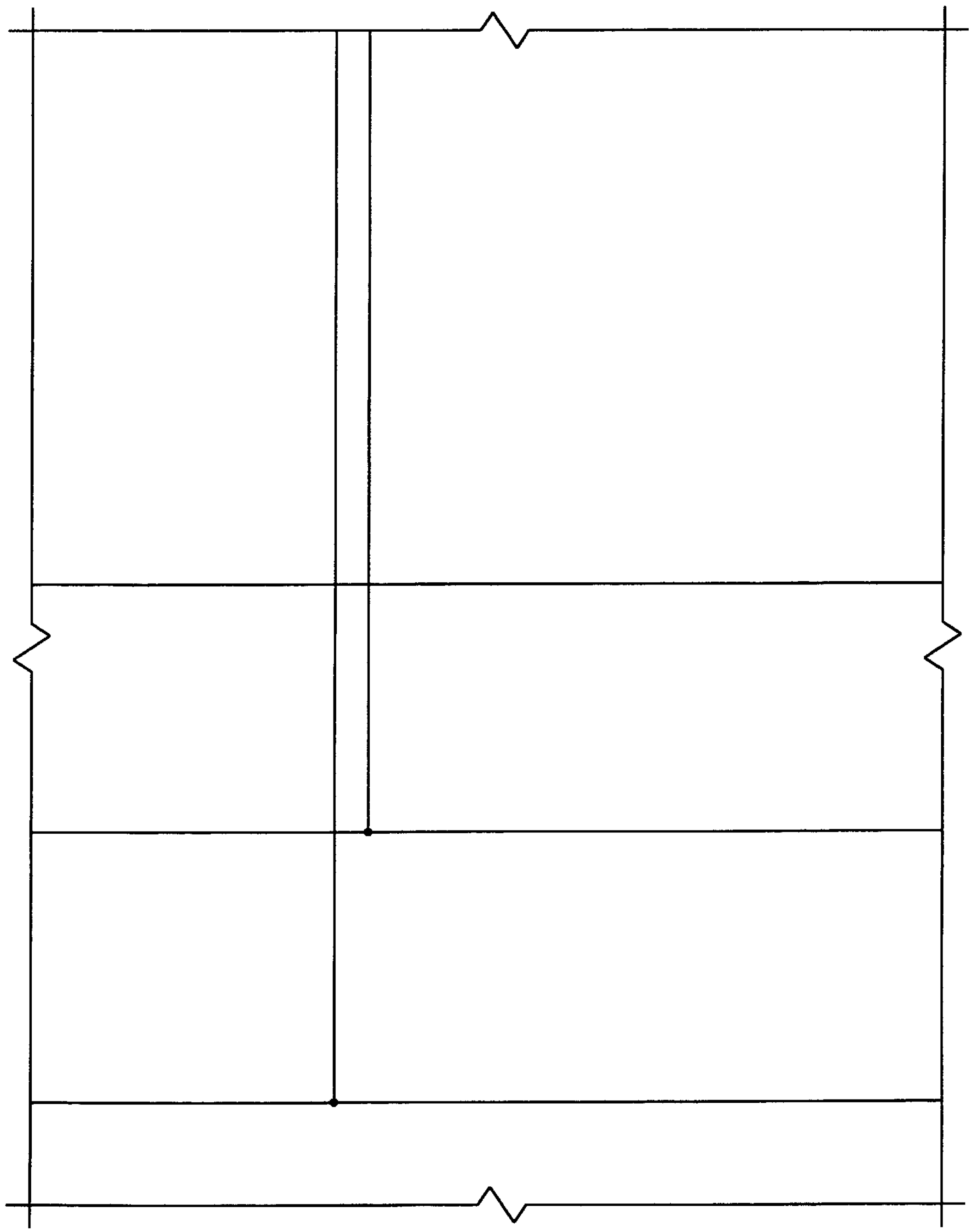
Fig 8.0101CE

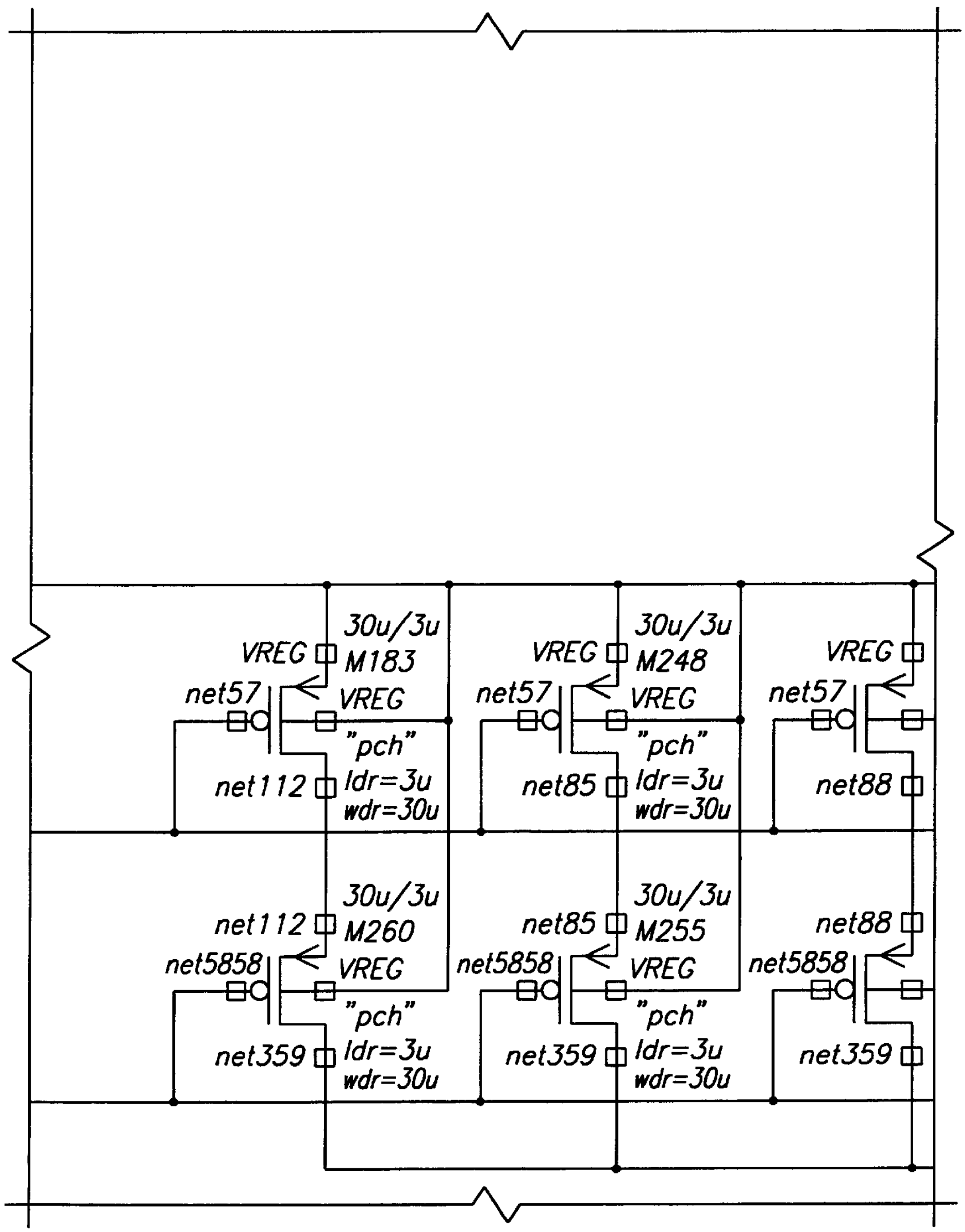
Fig 8.0101CF

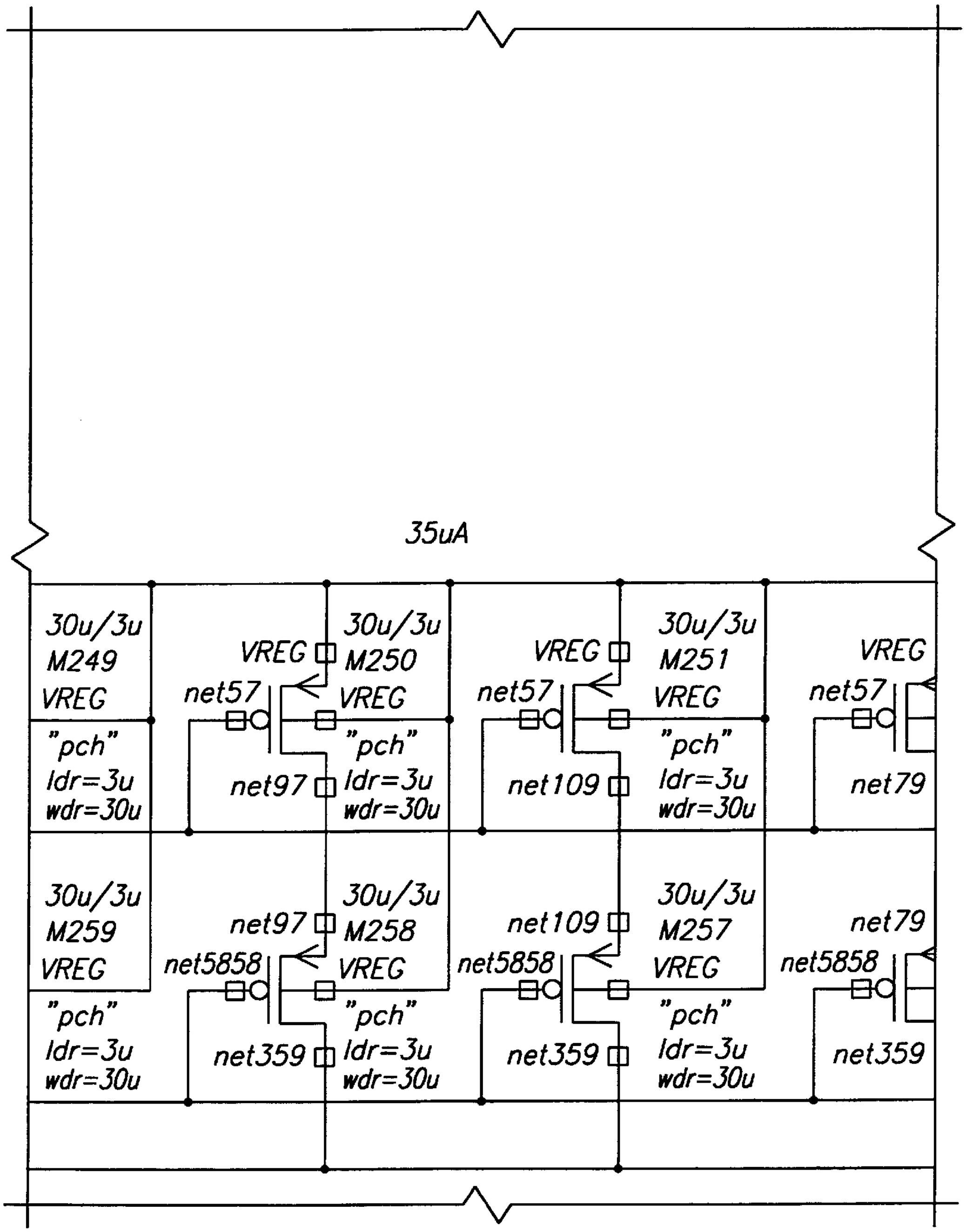
Fig 8.101CG

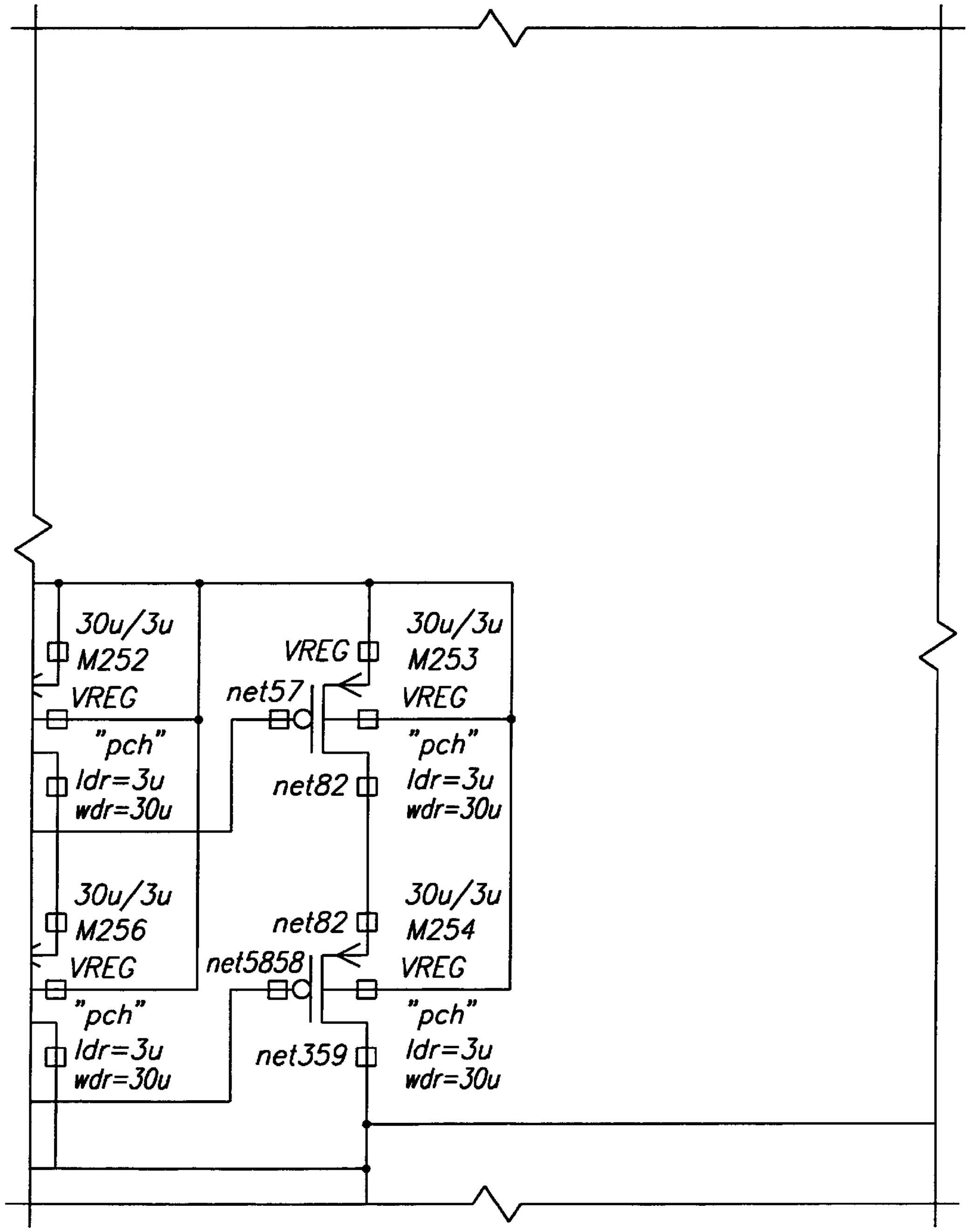
FIG. 8.010.1CH

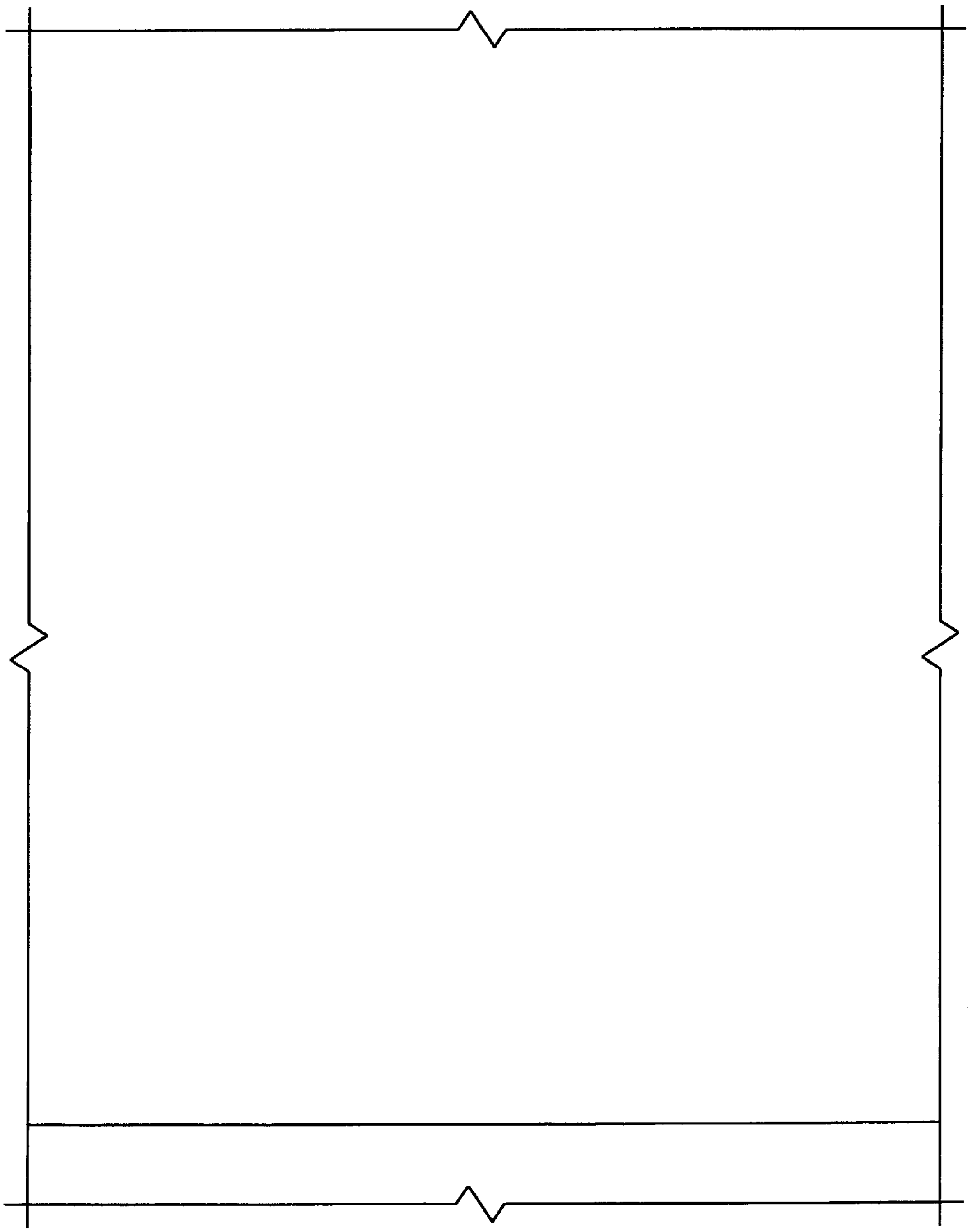
Fig 8.0107CI

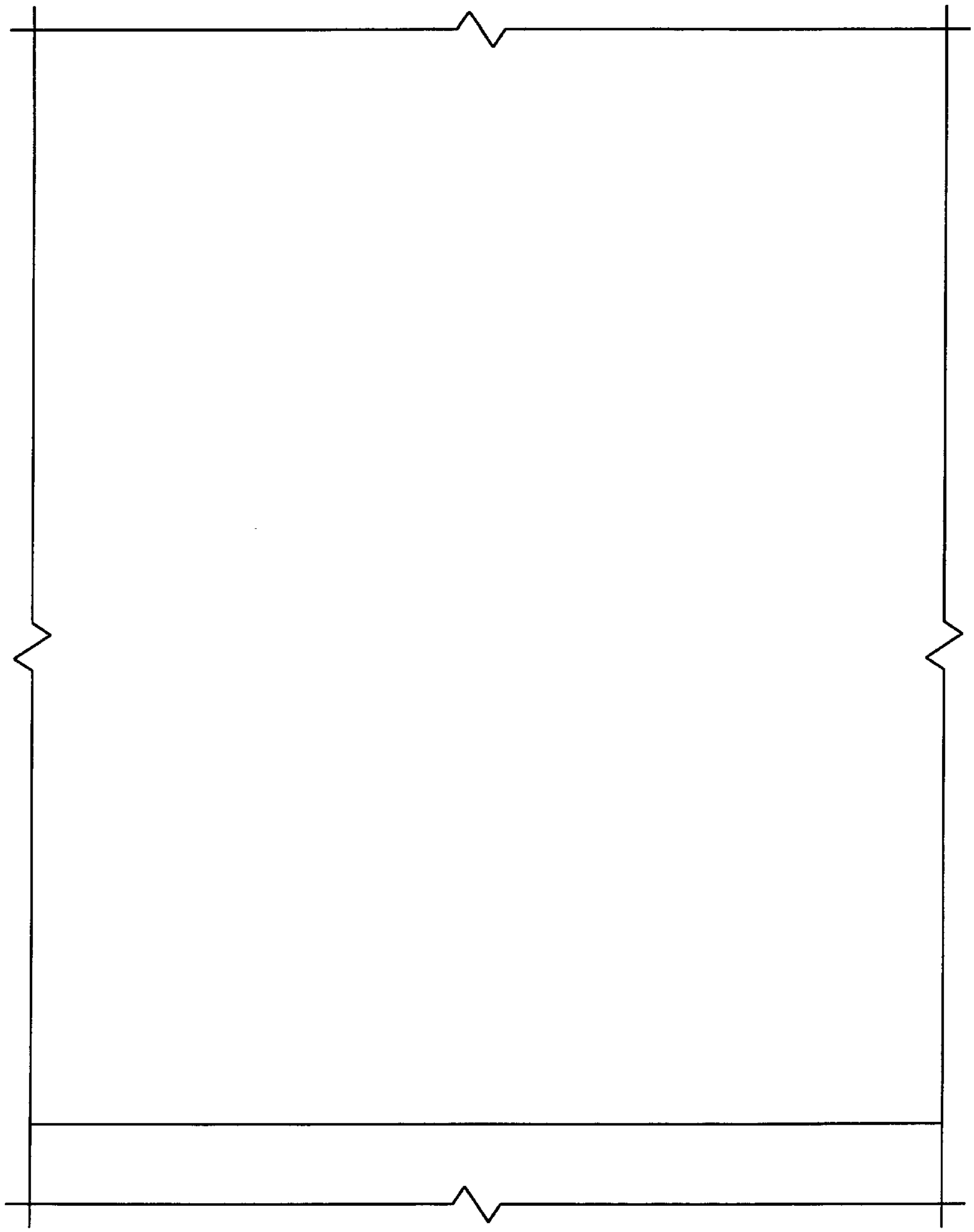
Fig 8.0107CJ

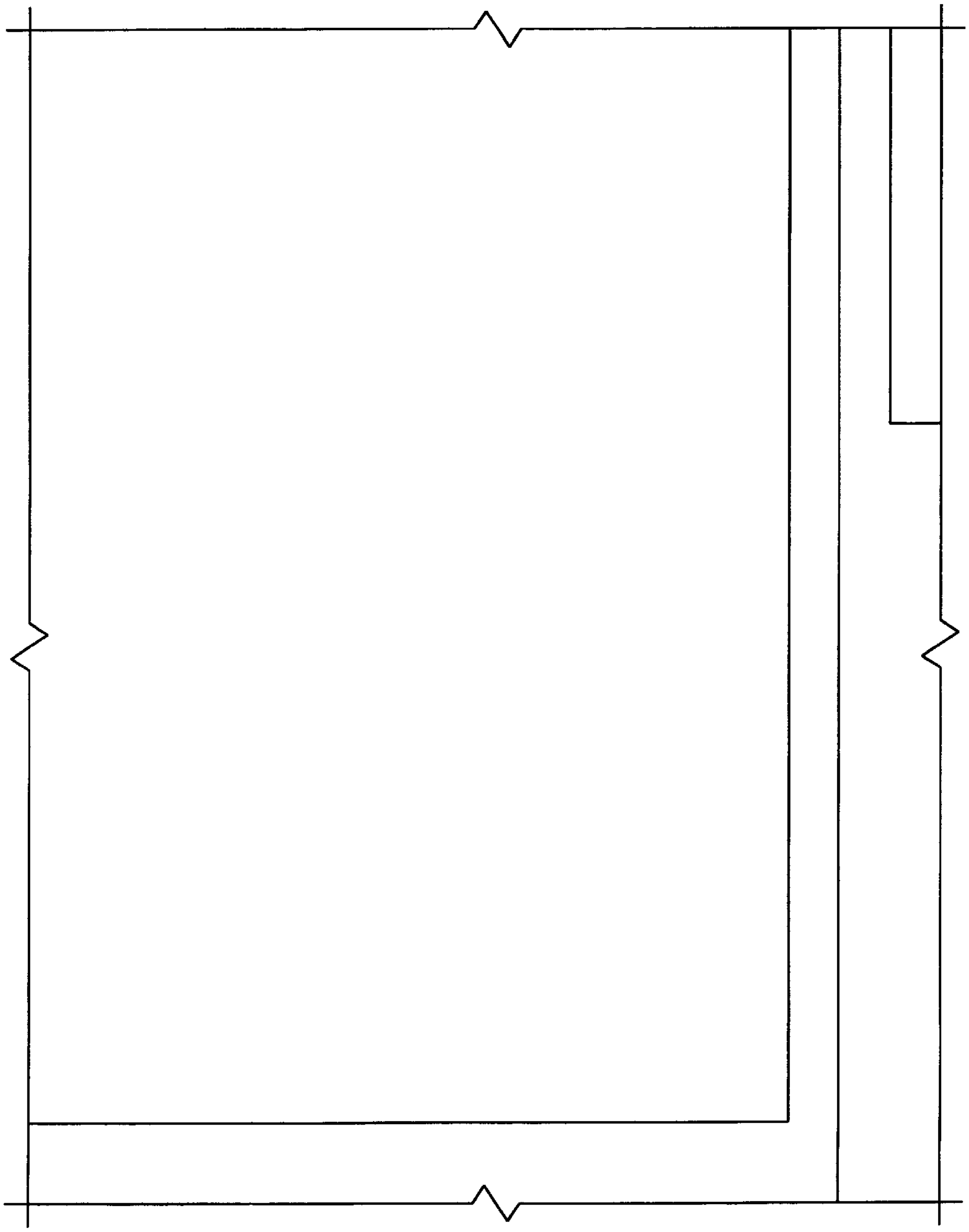
FIG. 8.0101CK

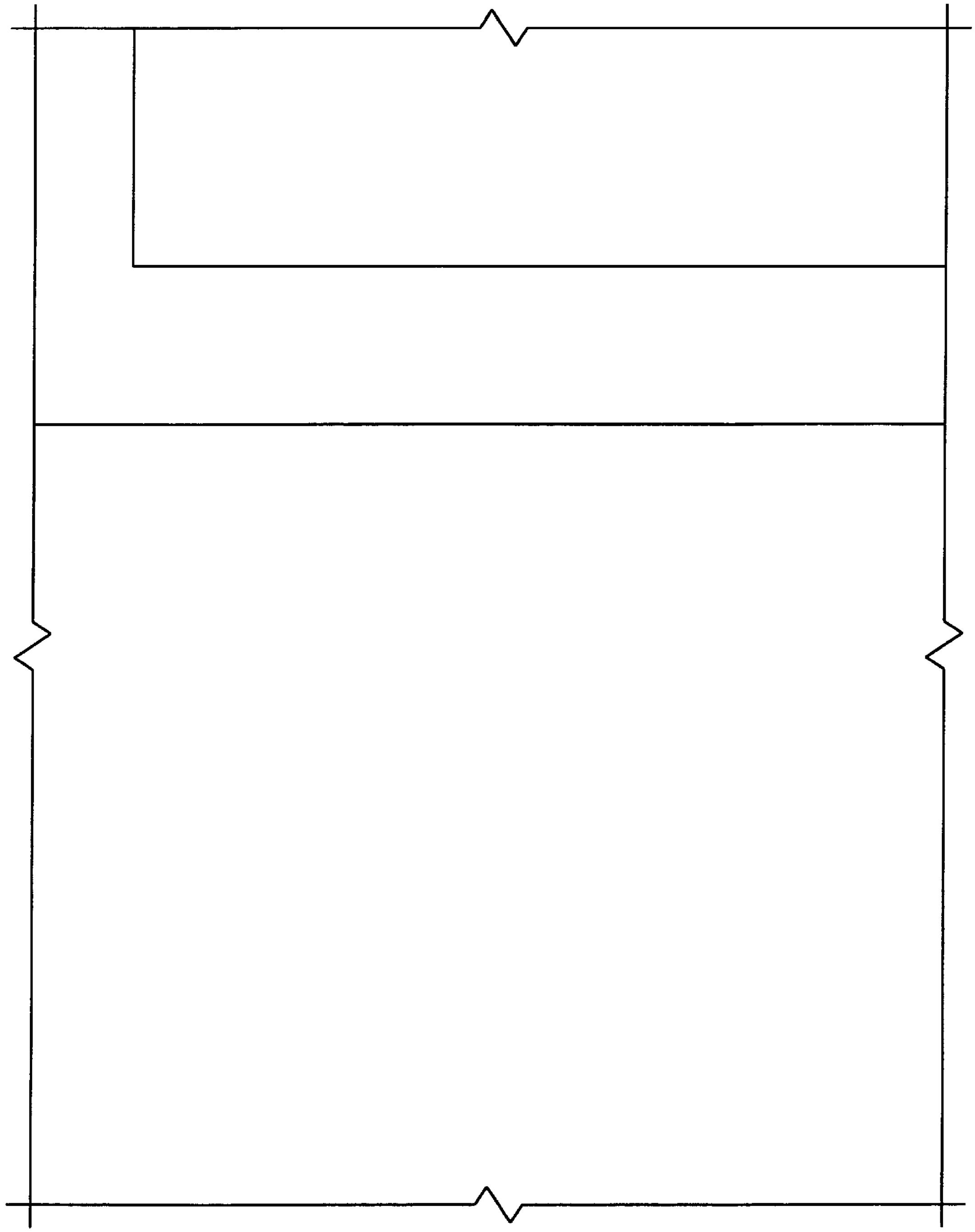
Fig 8.0101CL

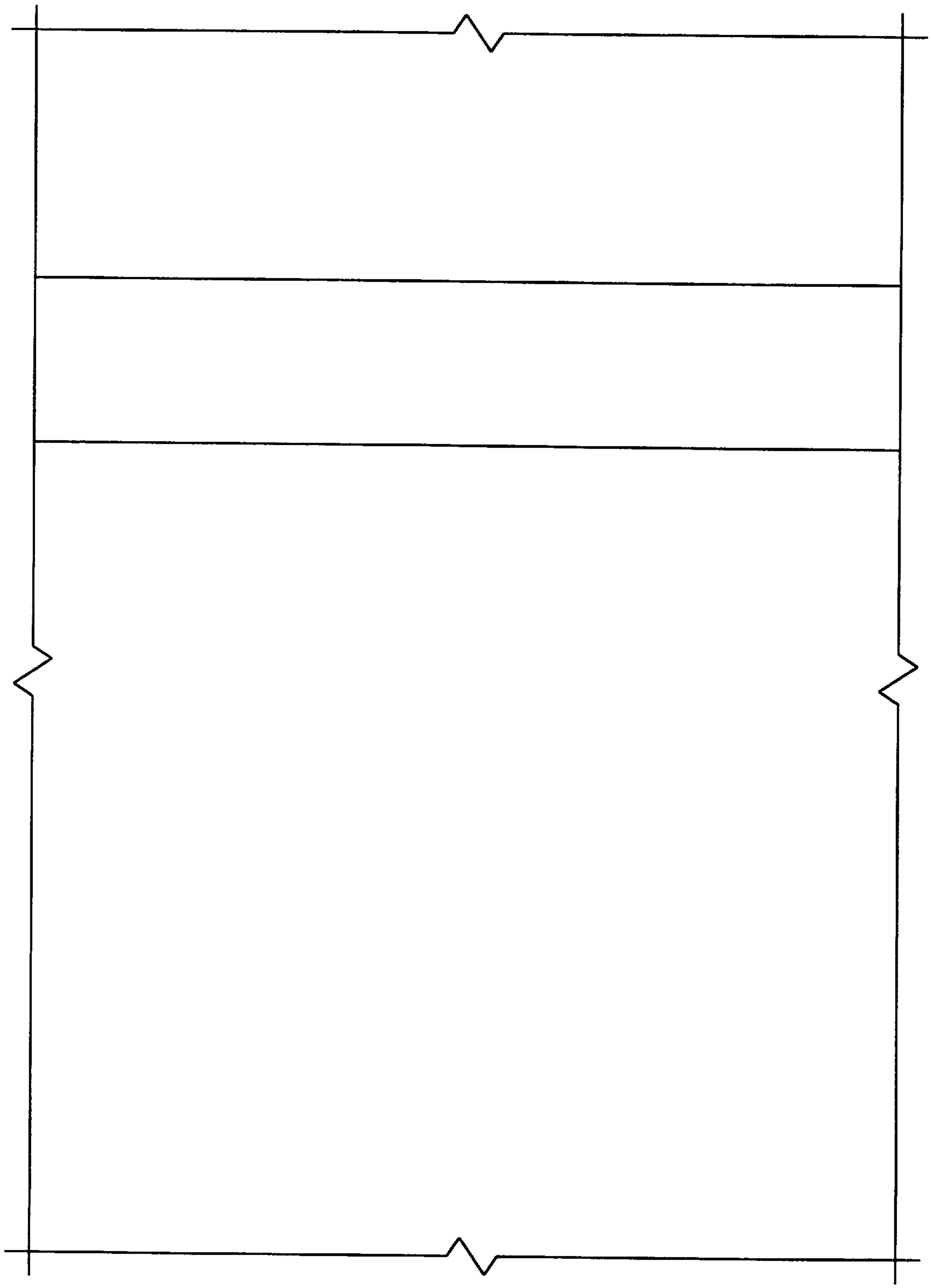
Fig 8.0107CM

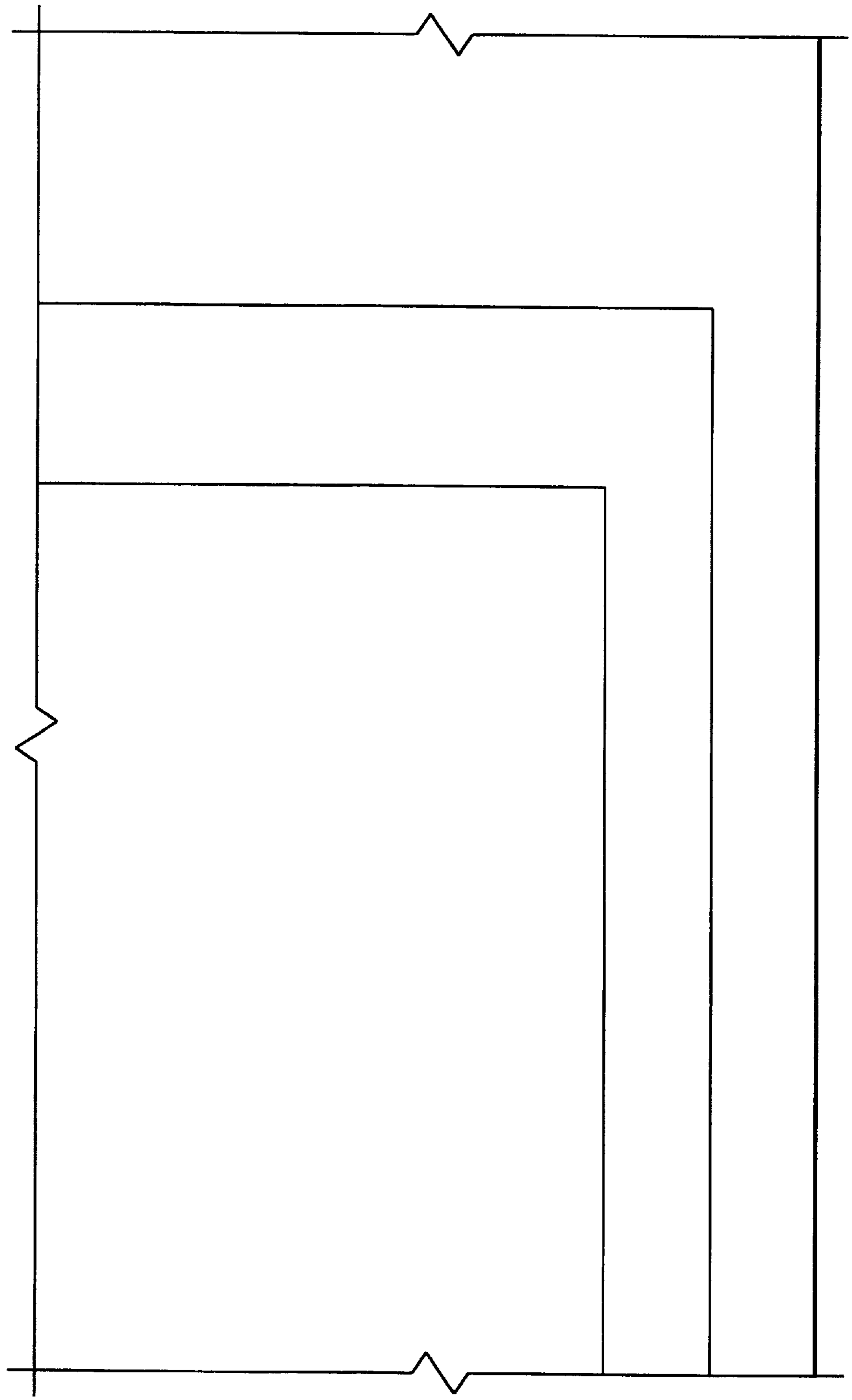
Fig 8.0101CN

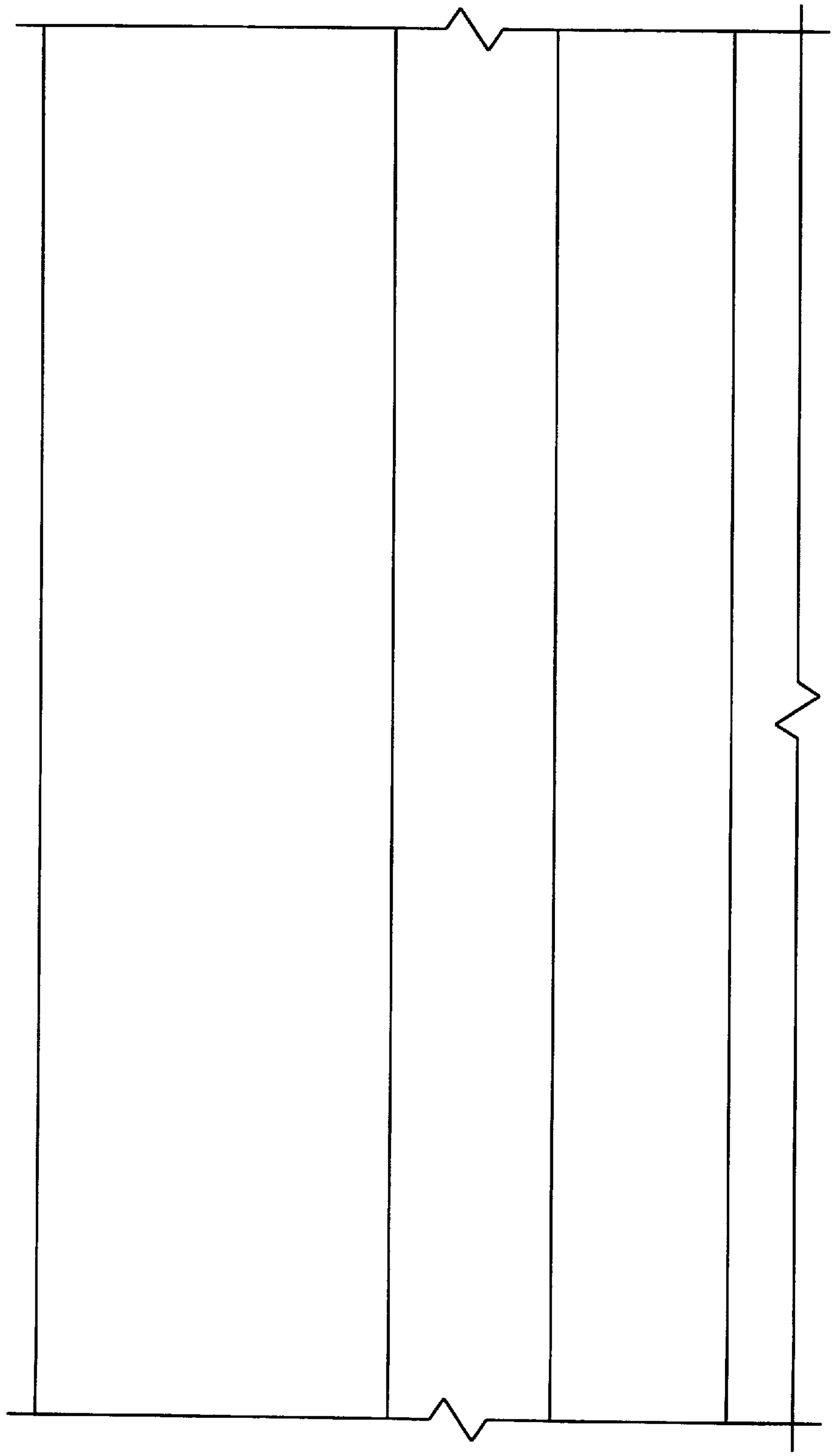
FIG. 8.0101DA

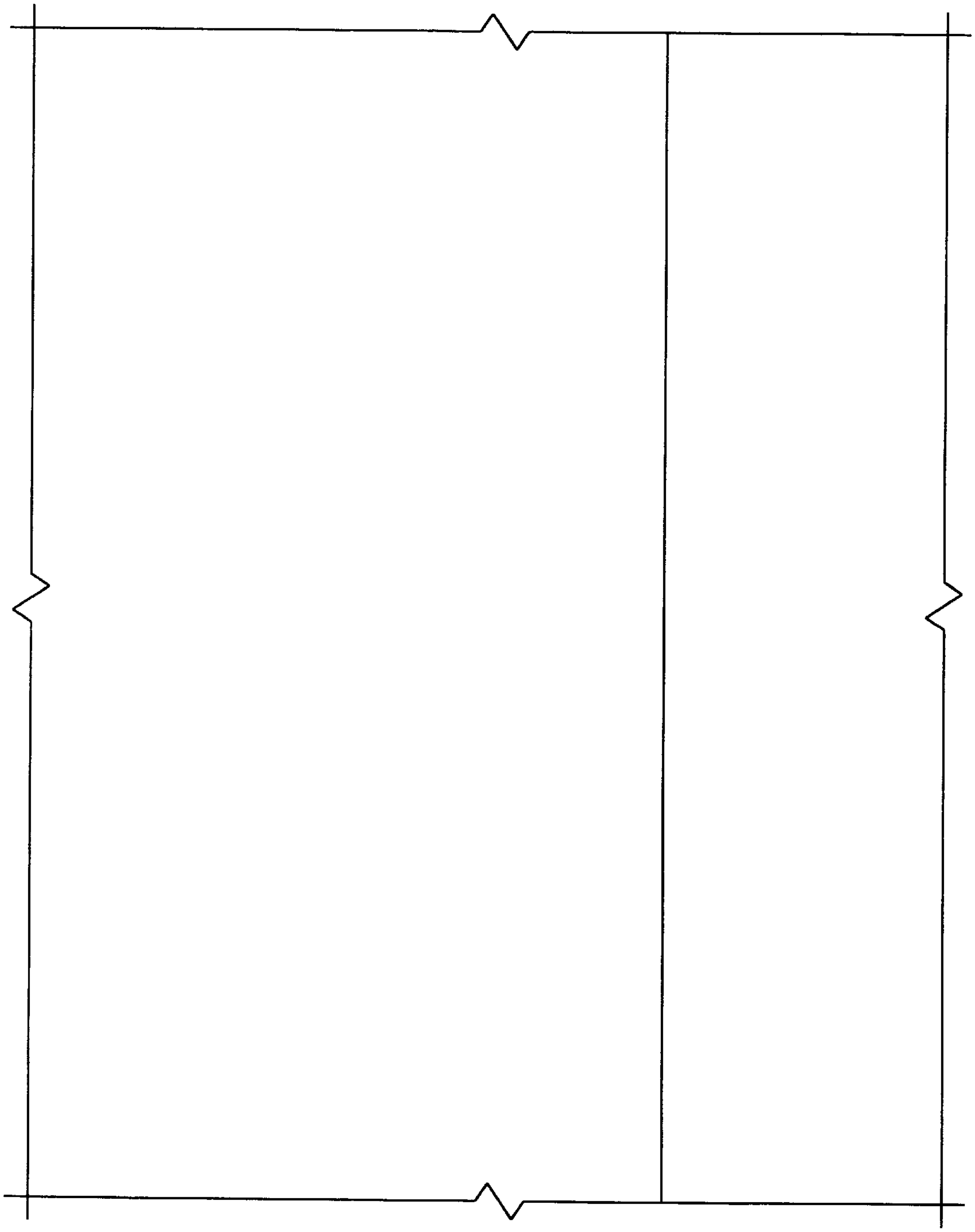
Fig. 8.0107DB

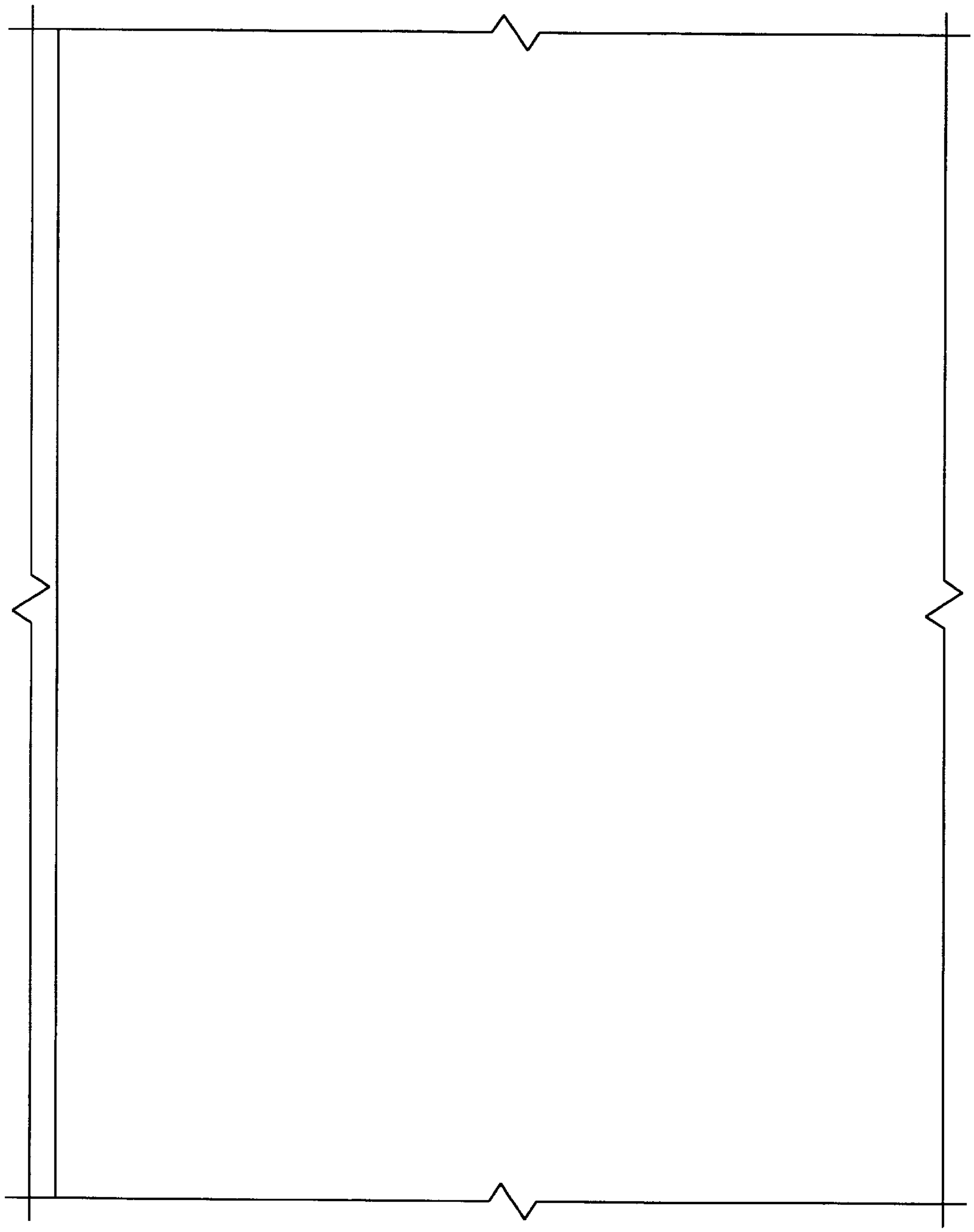
Fig 8.0107DC

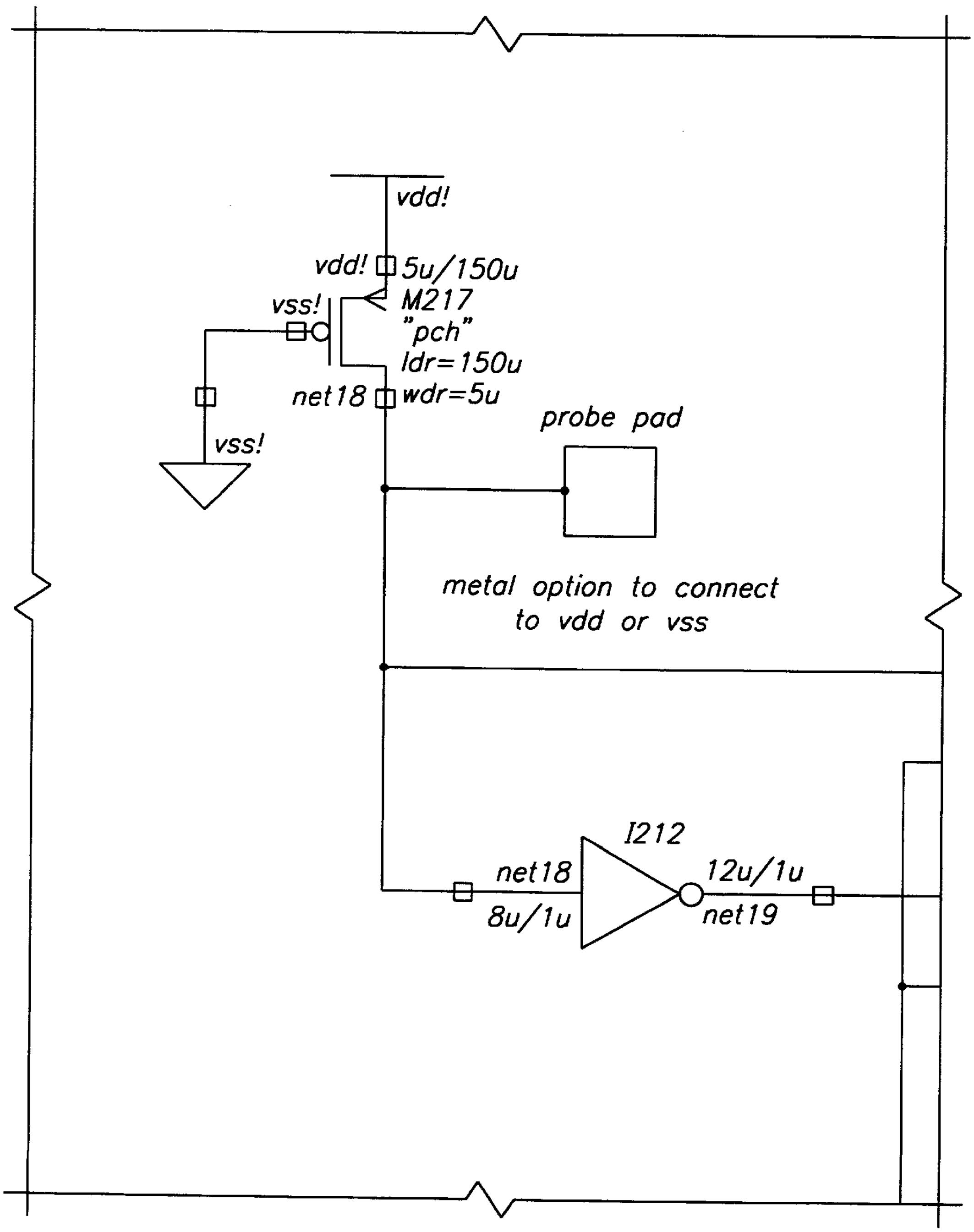
Fig. 8.01071DD

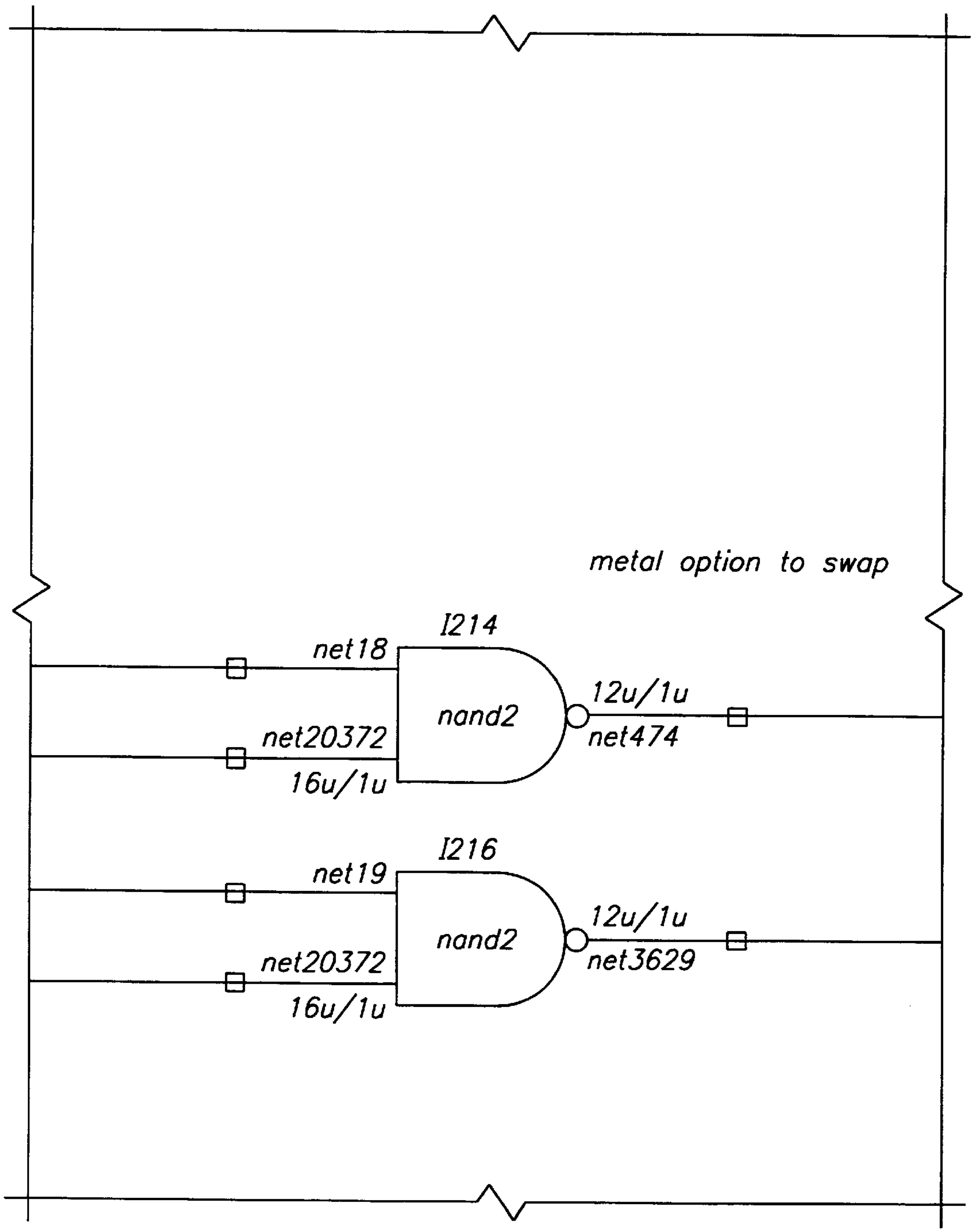
Fig 8.0107DE

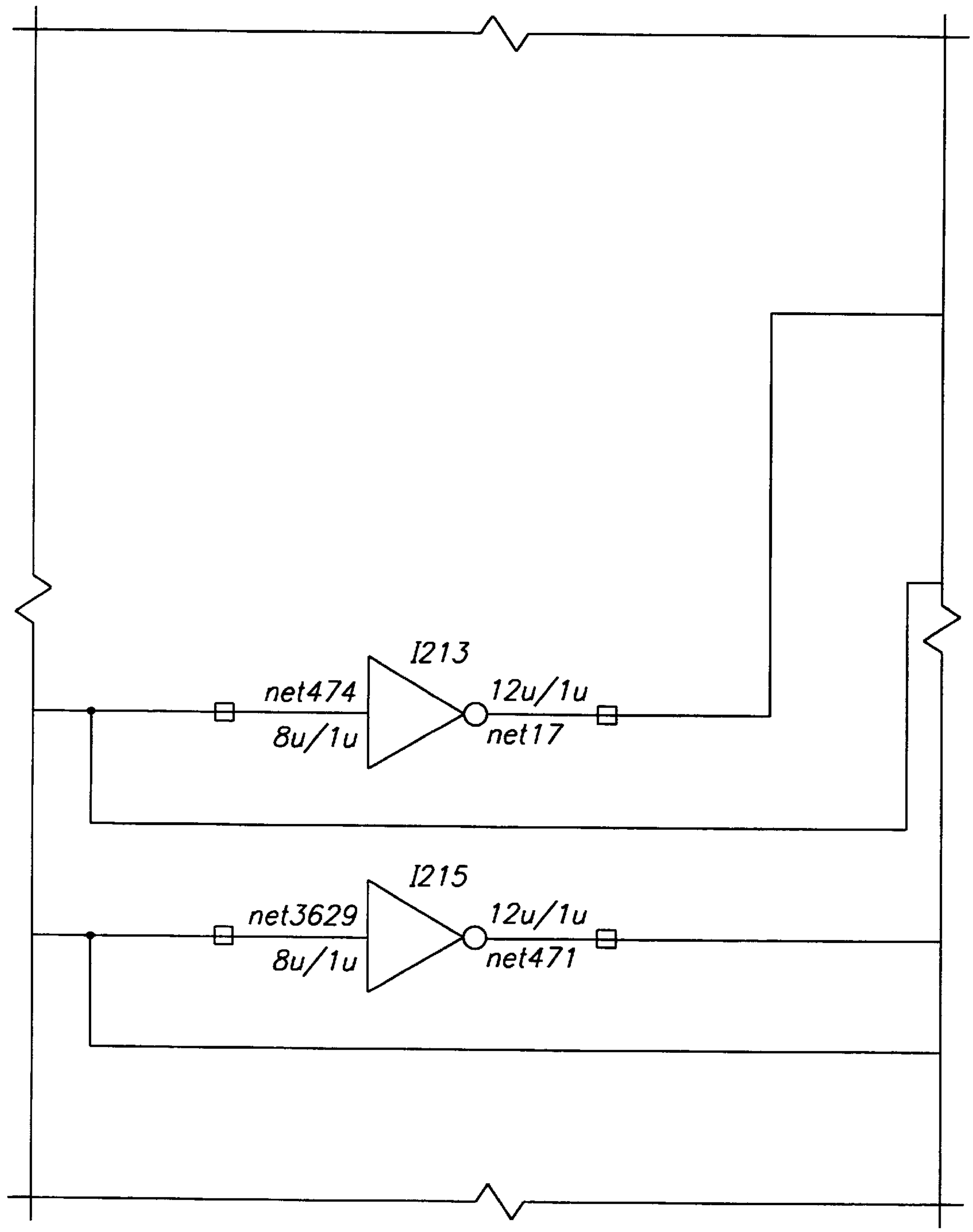
Fig 8.0107DF

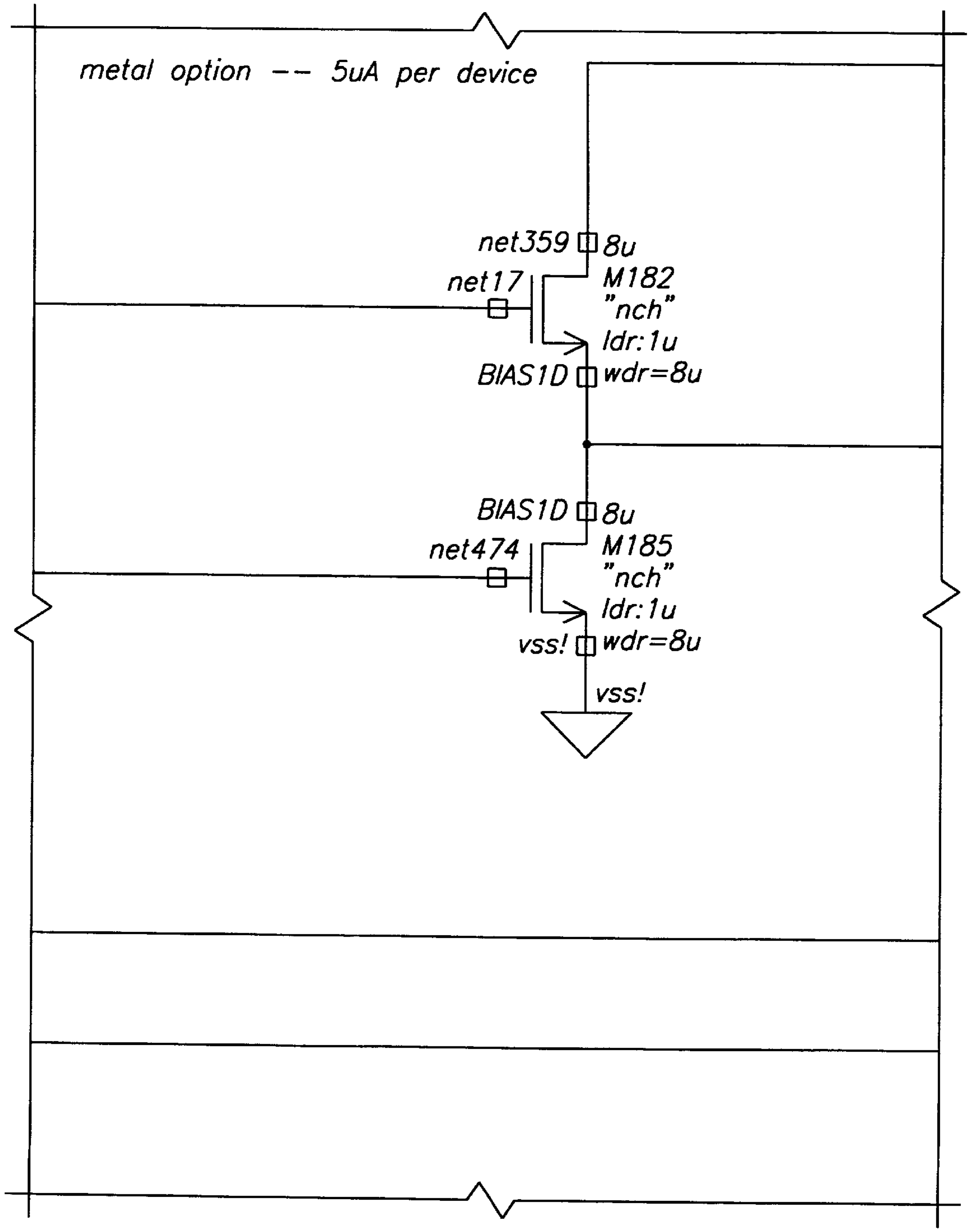
FIG 8.0107DG

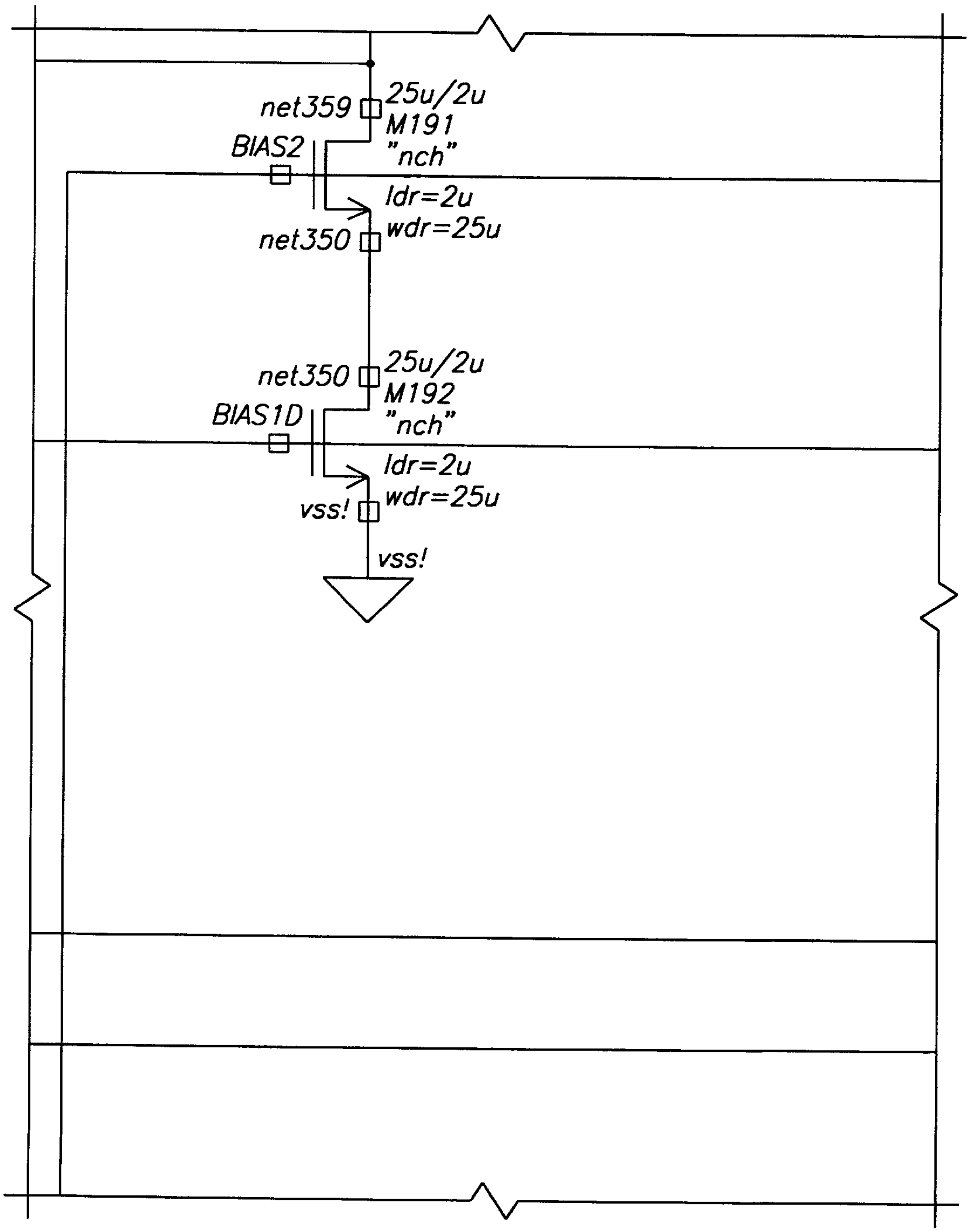
Fig 8.0107DH

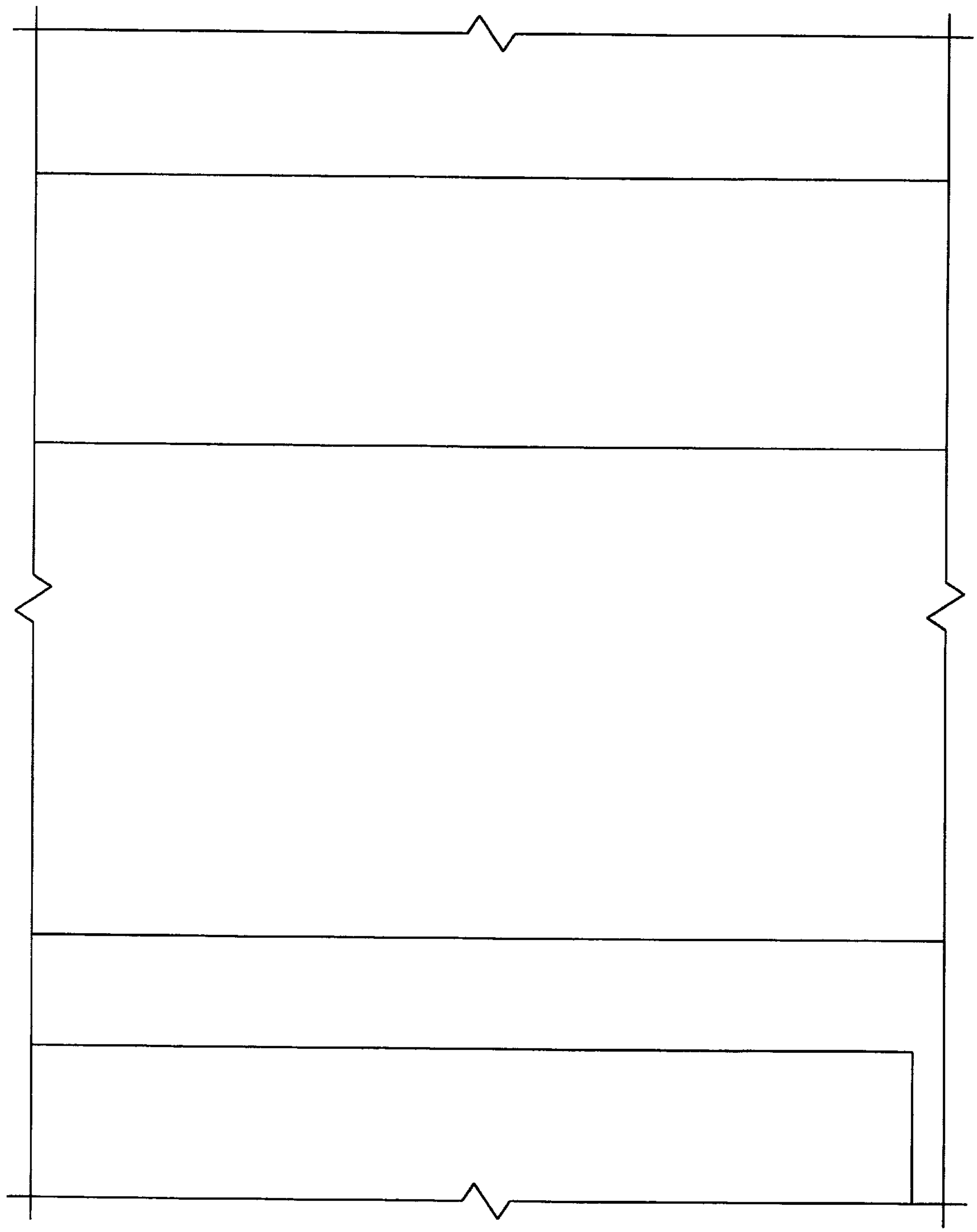
Fig. 8.0107DI

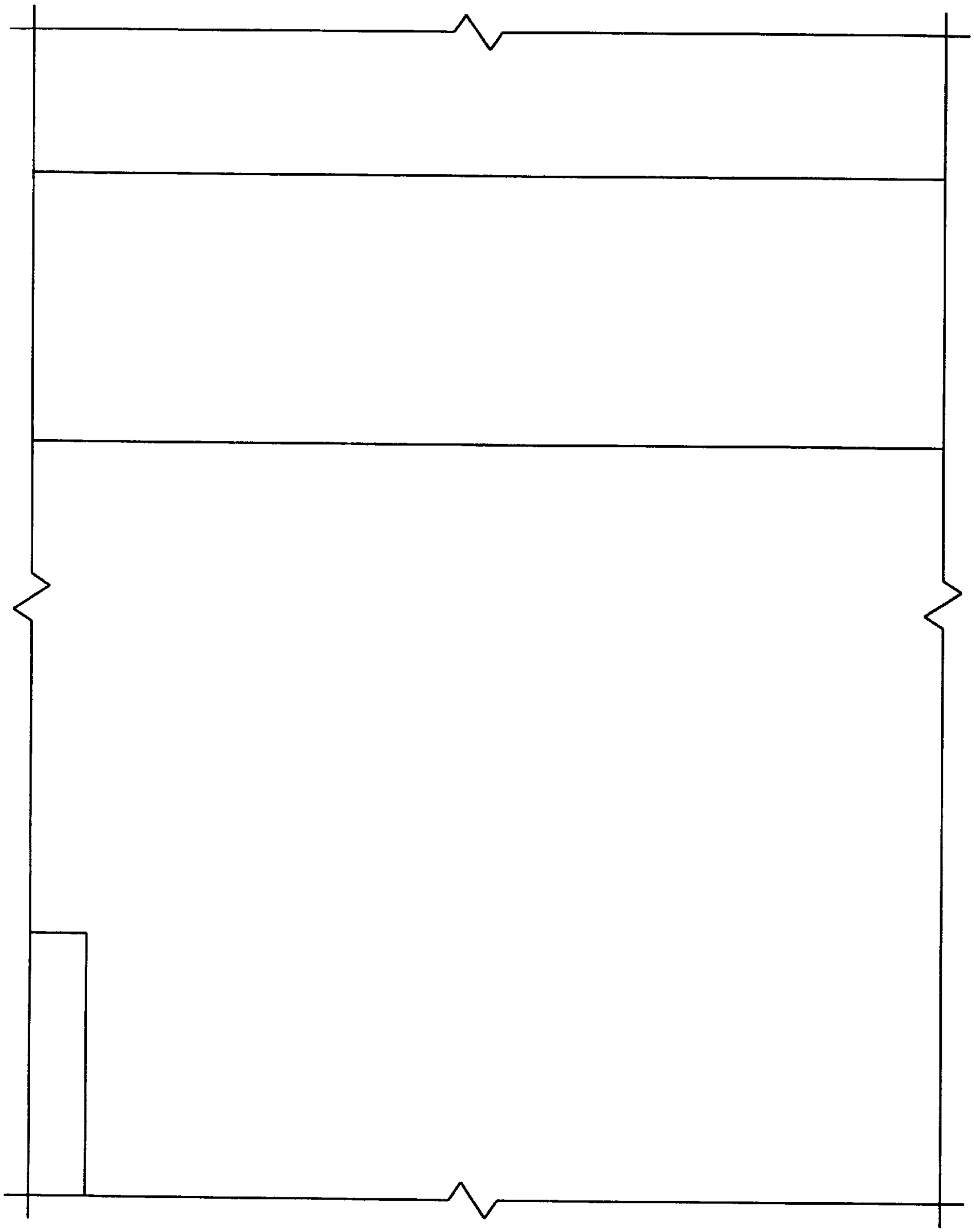
Fig 8.0107Da

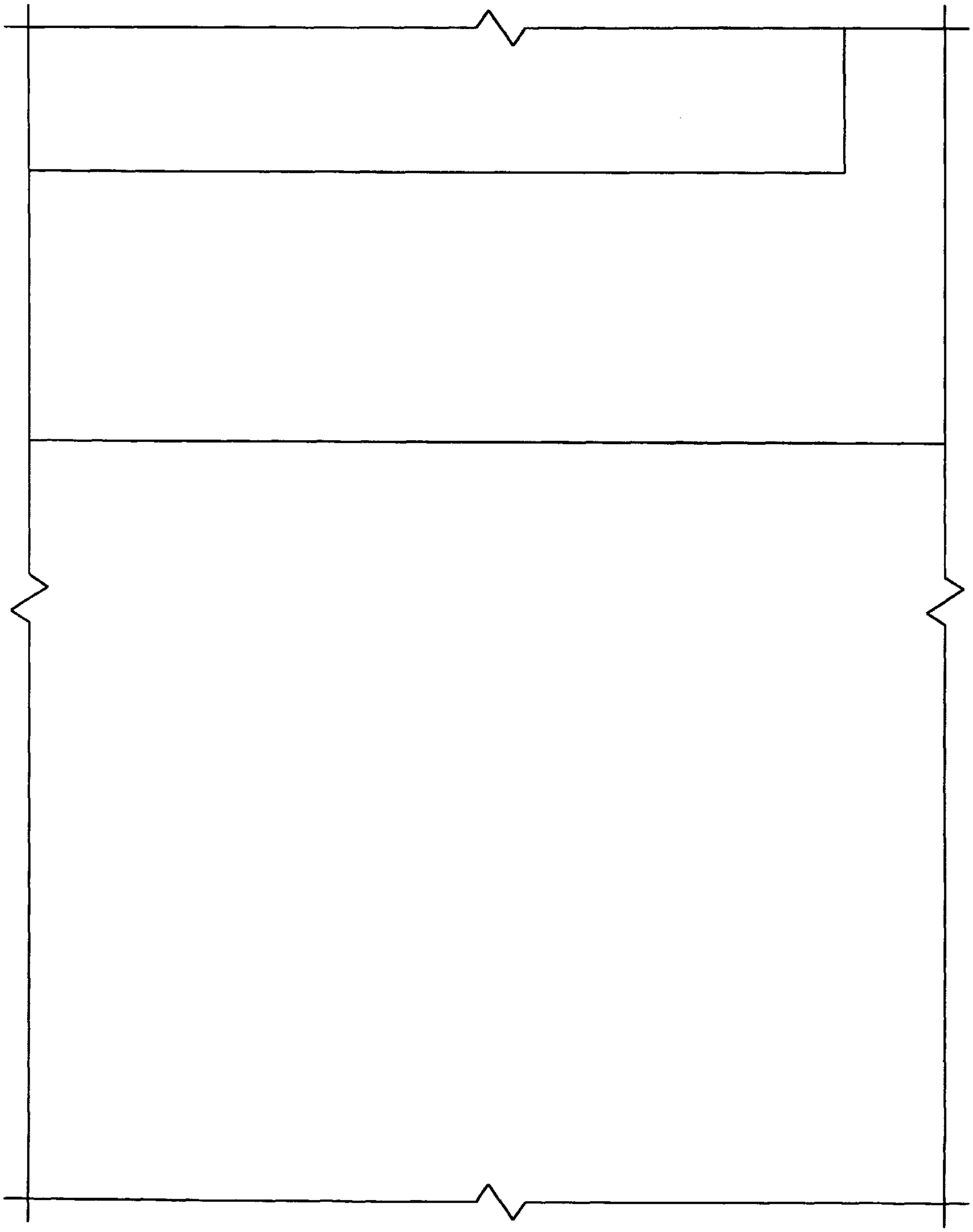
Fig 8.0101DK

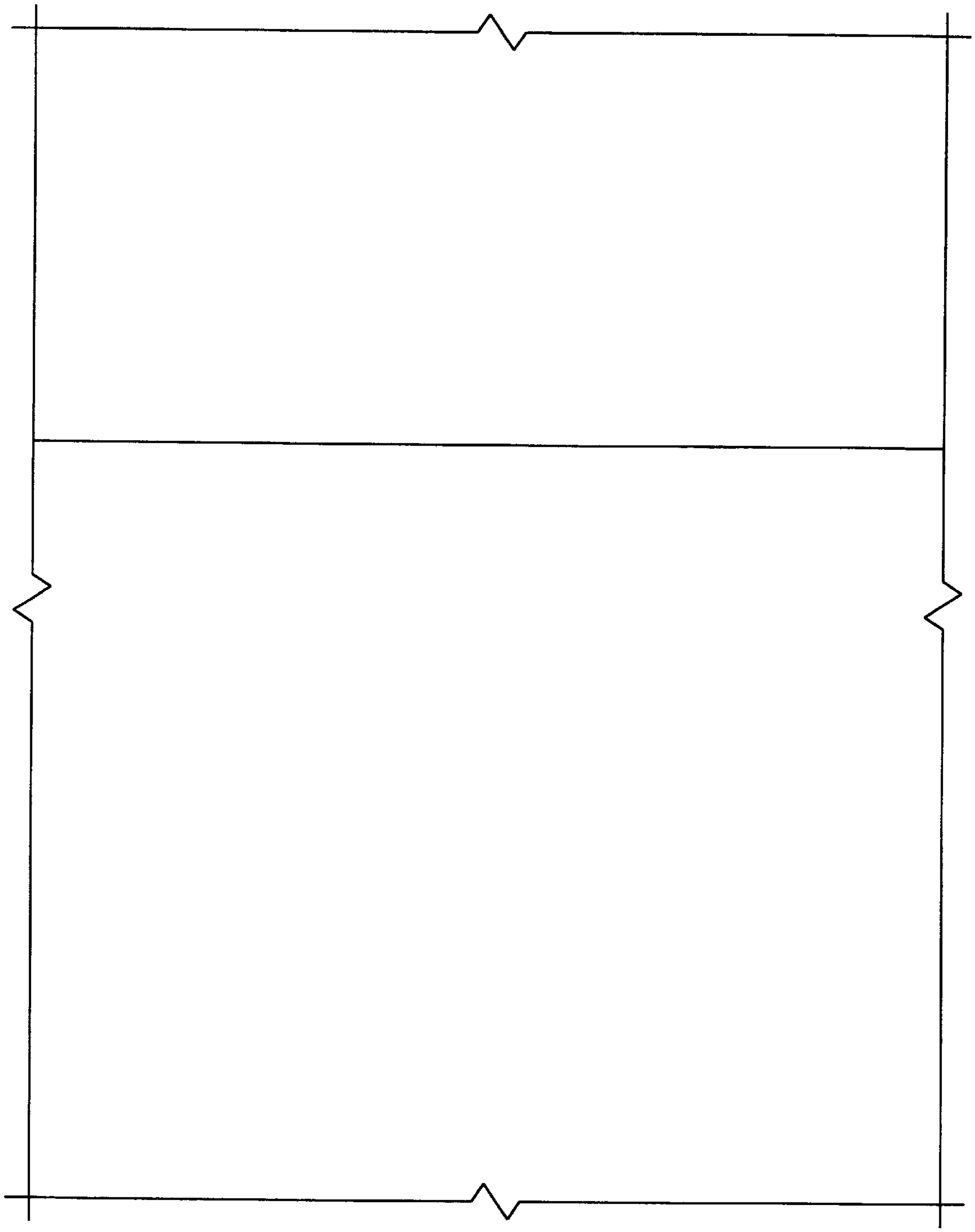
Fig. 8.0107DL

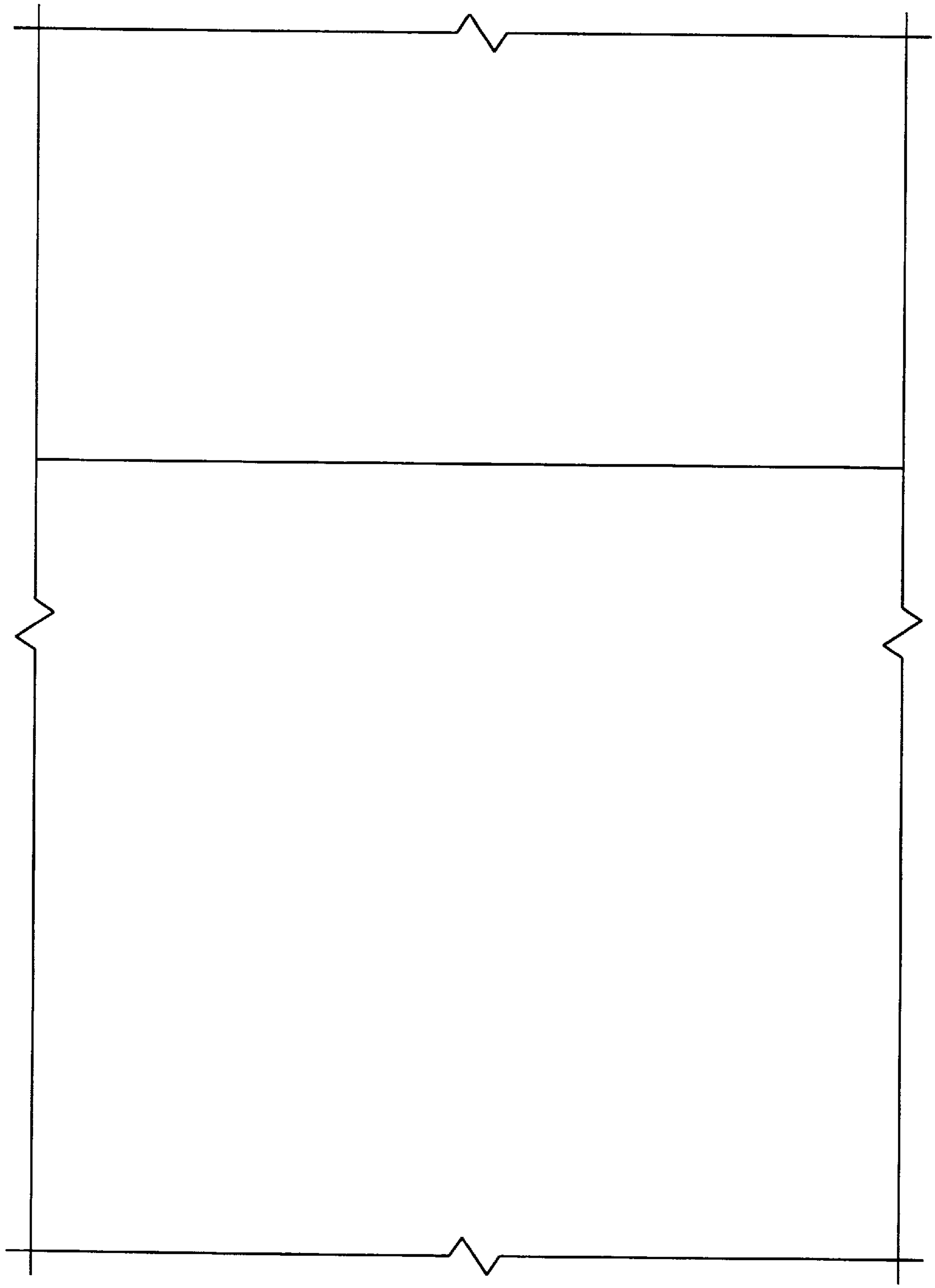
Fig 8.0107DM

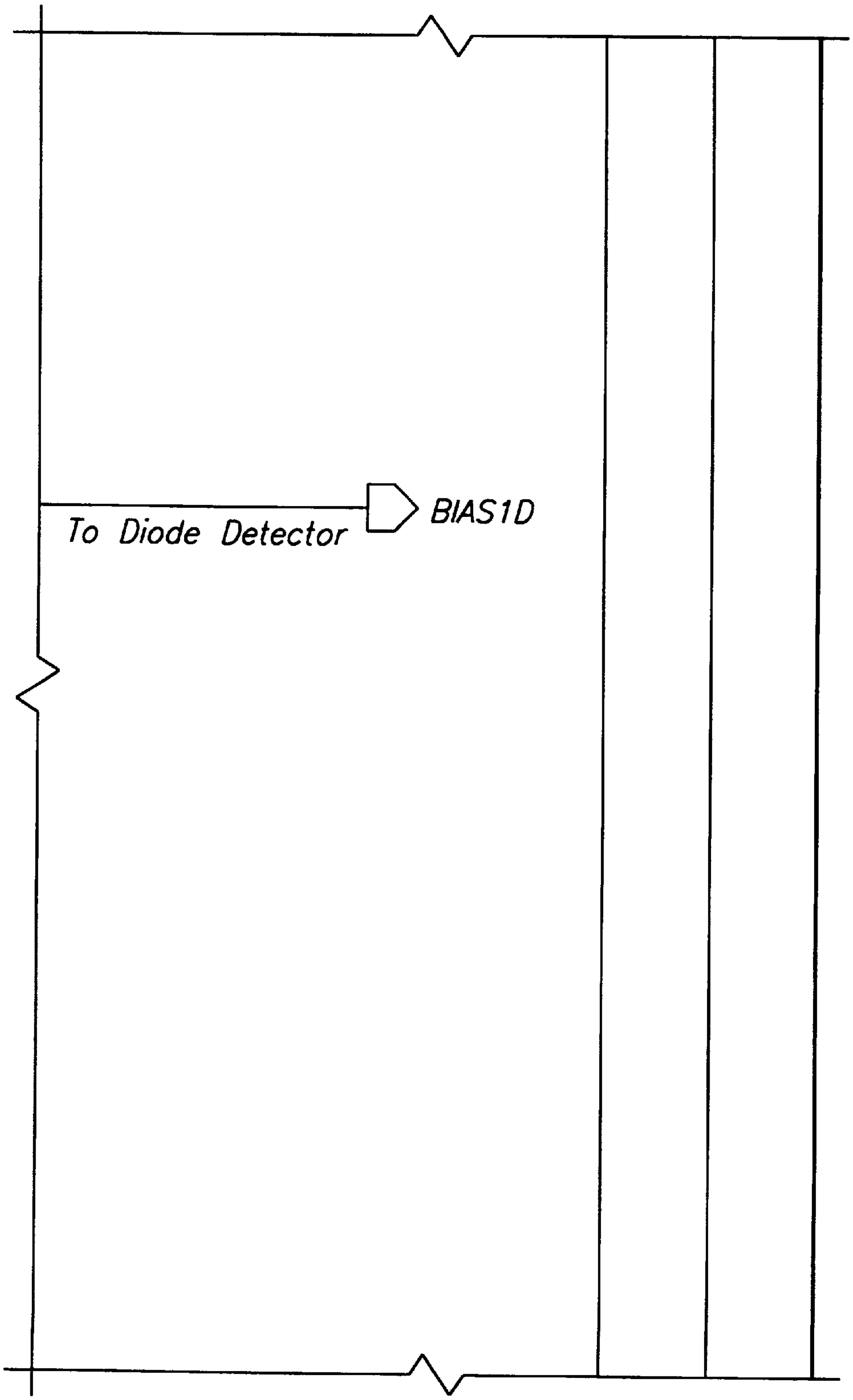
Fig. 8.0101DN

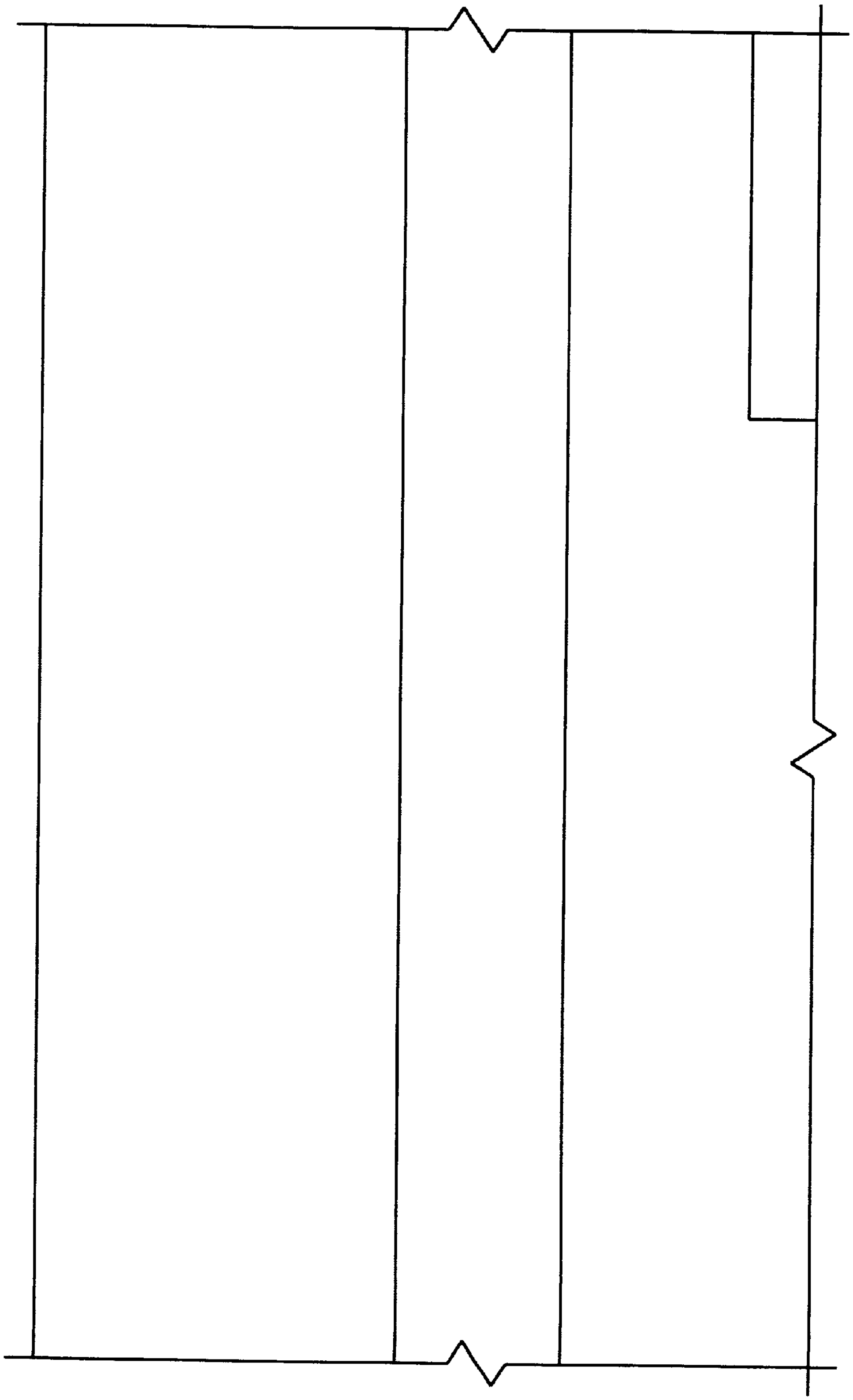
FIG 8.0107EA

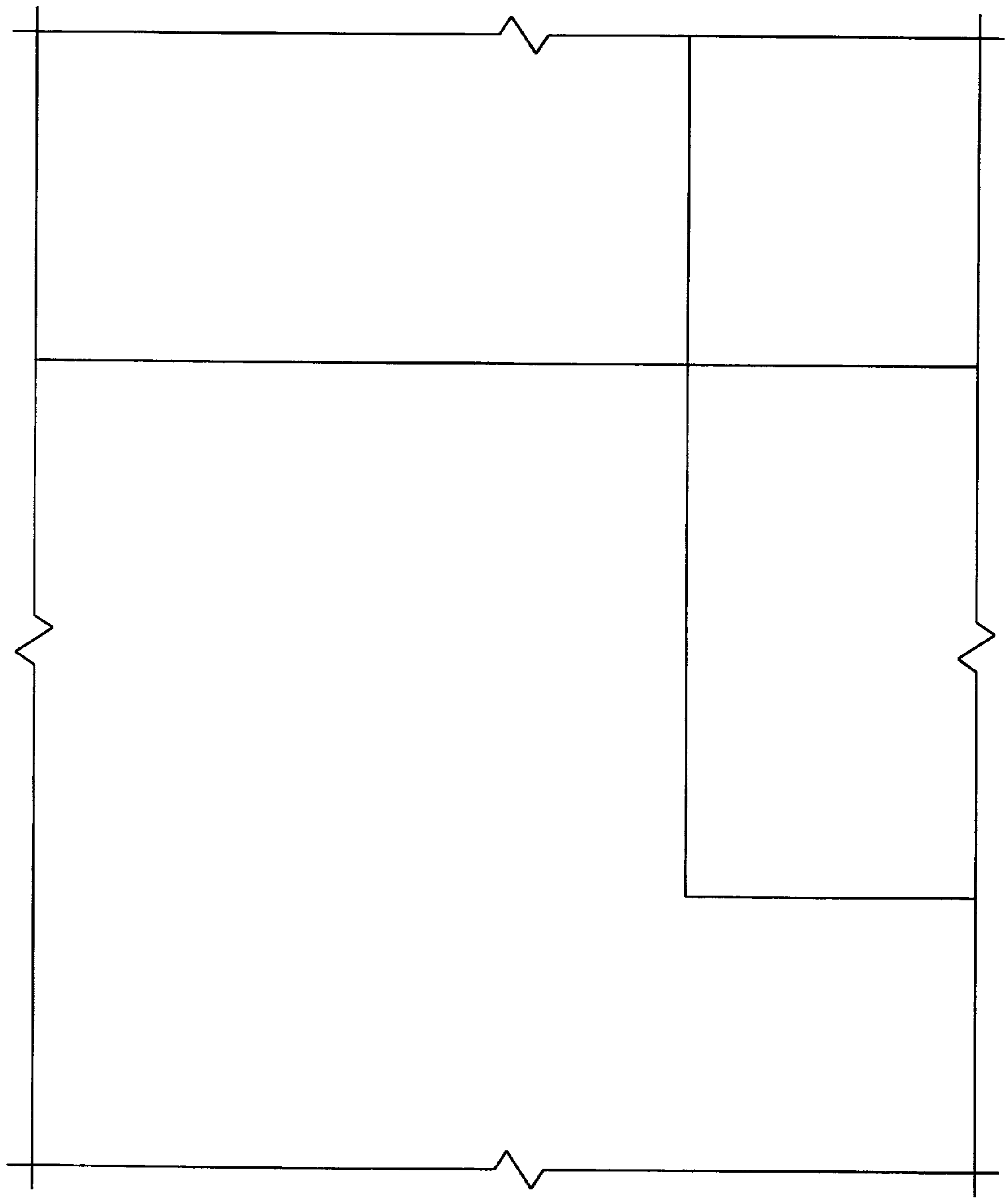
Fig 8.0107EB

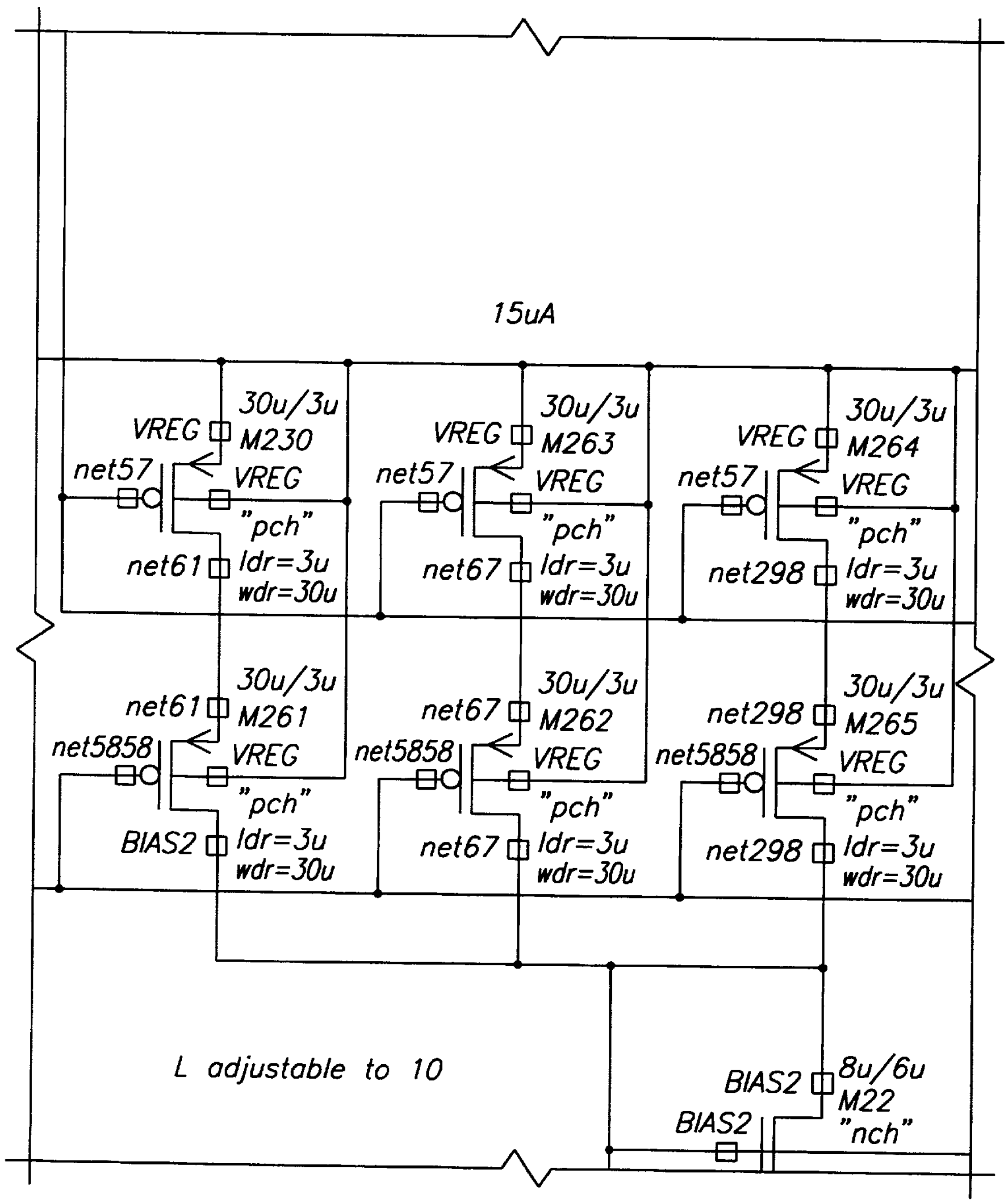
Fig 8.101EC

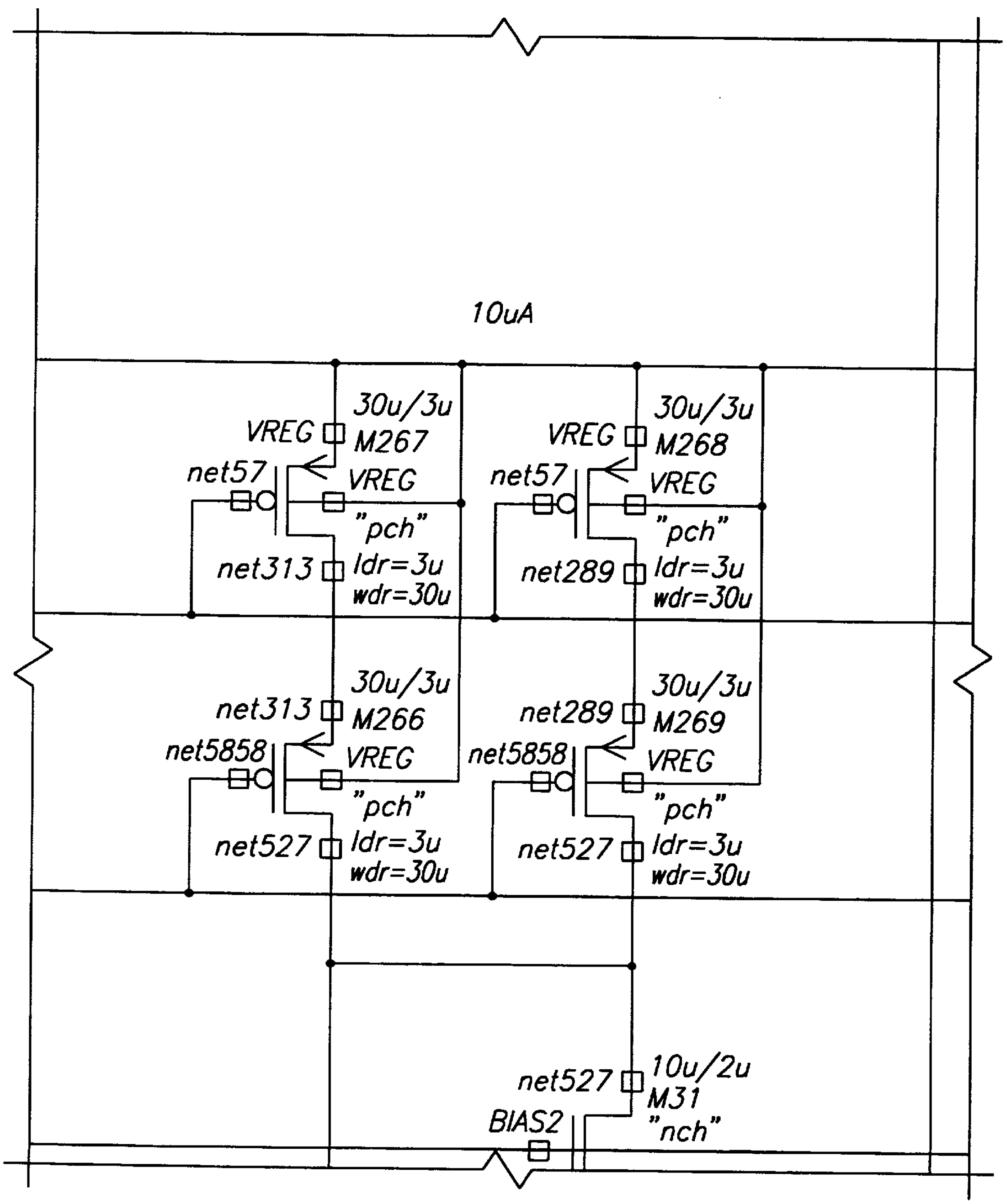
Fig 8.010ED

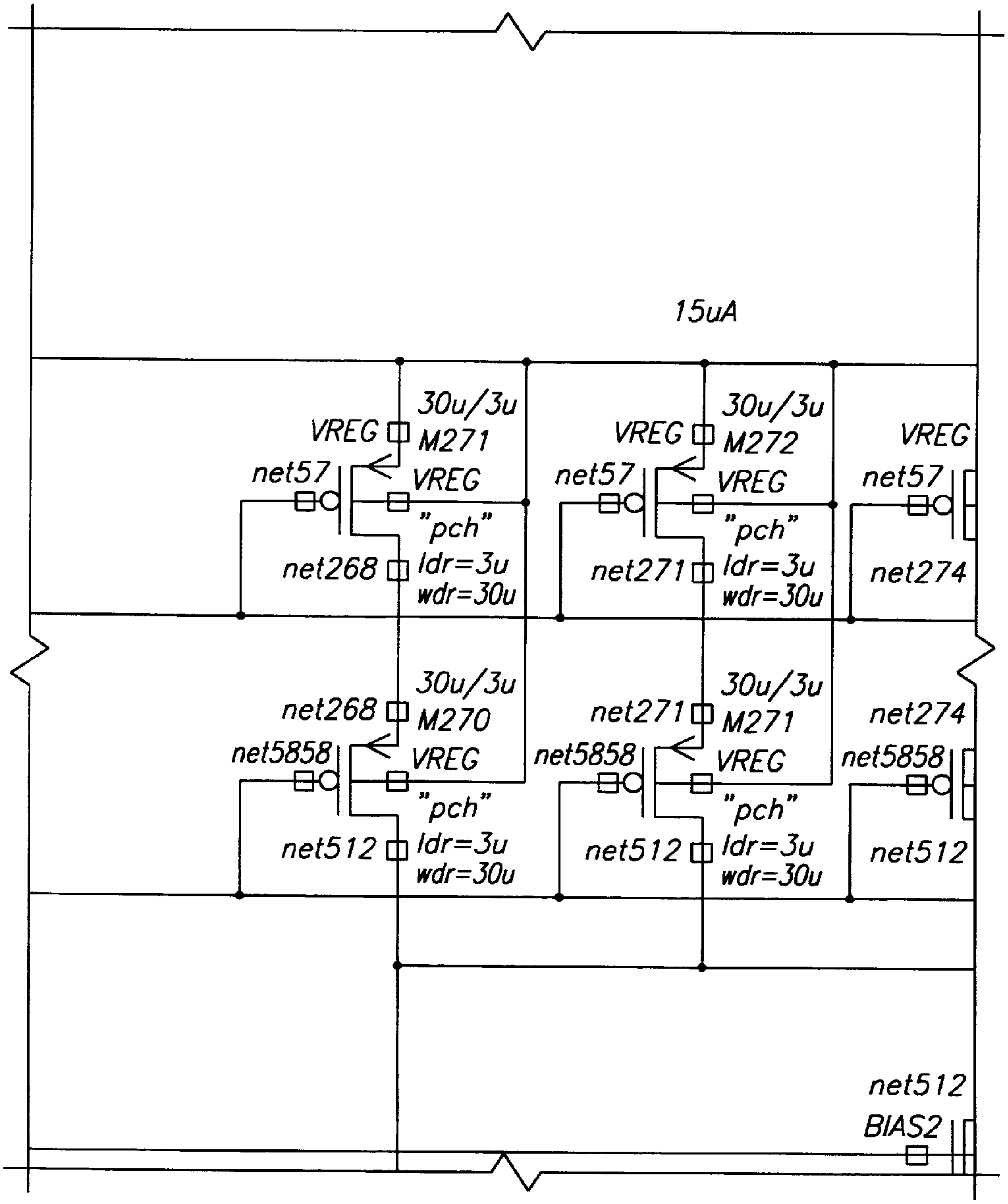
Fig 8.0107EE

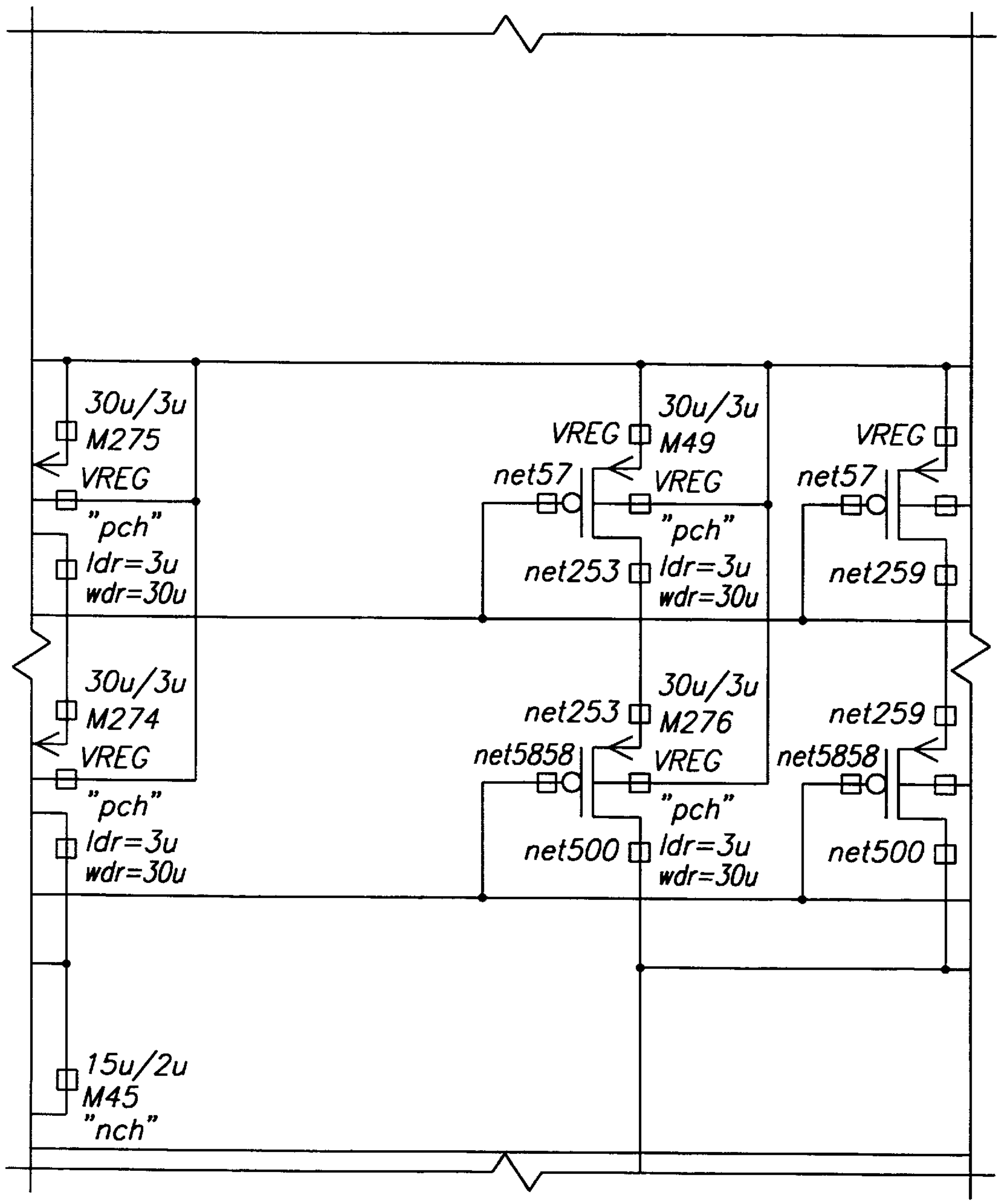
FIG 8.010EF

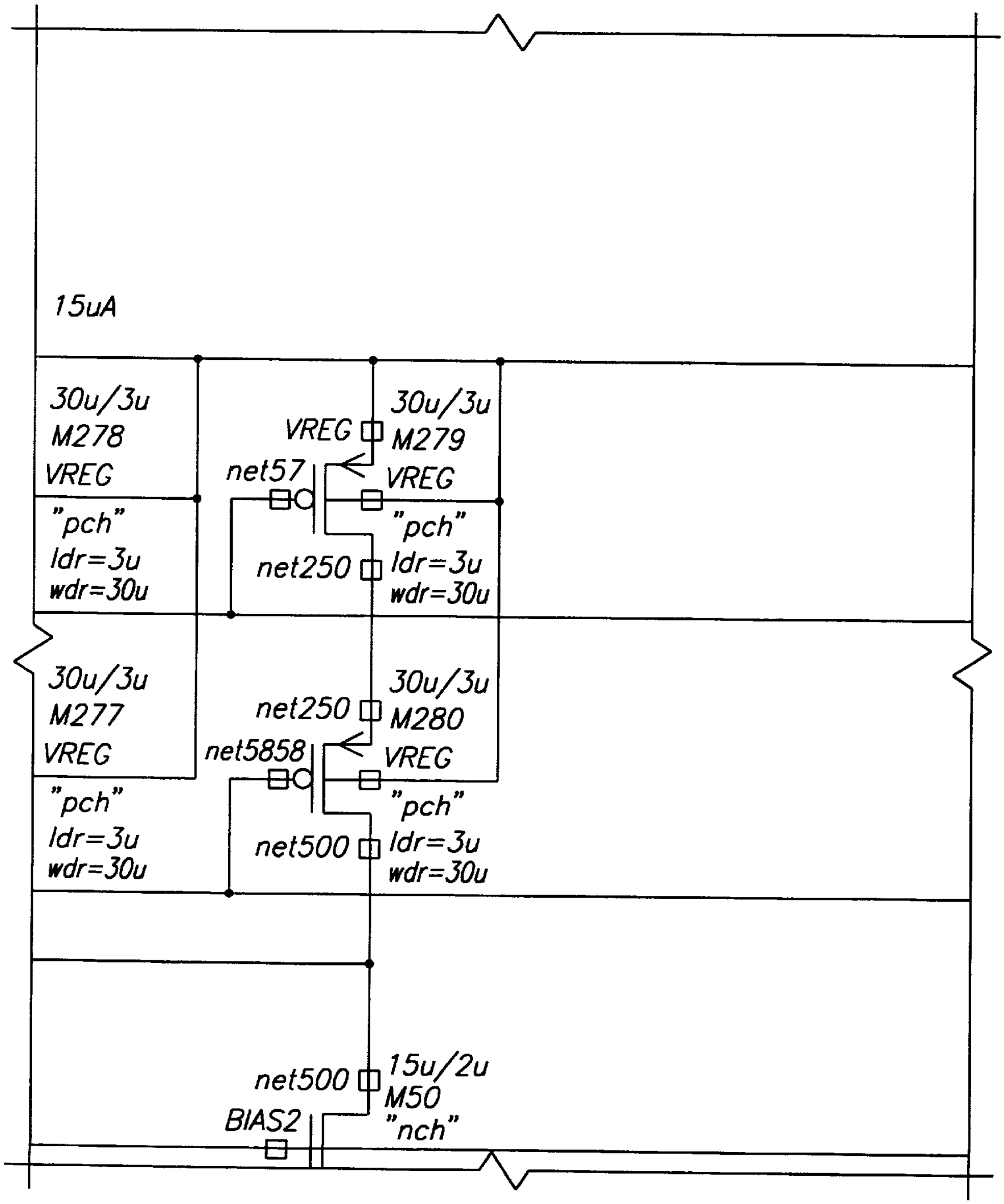
FIG 8.010EG

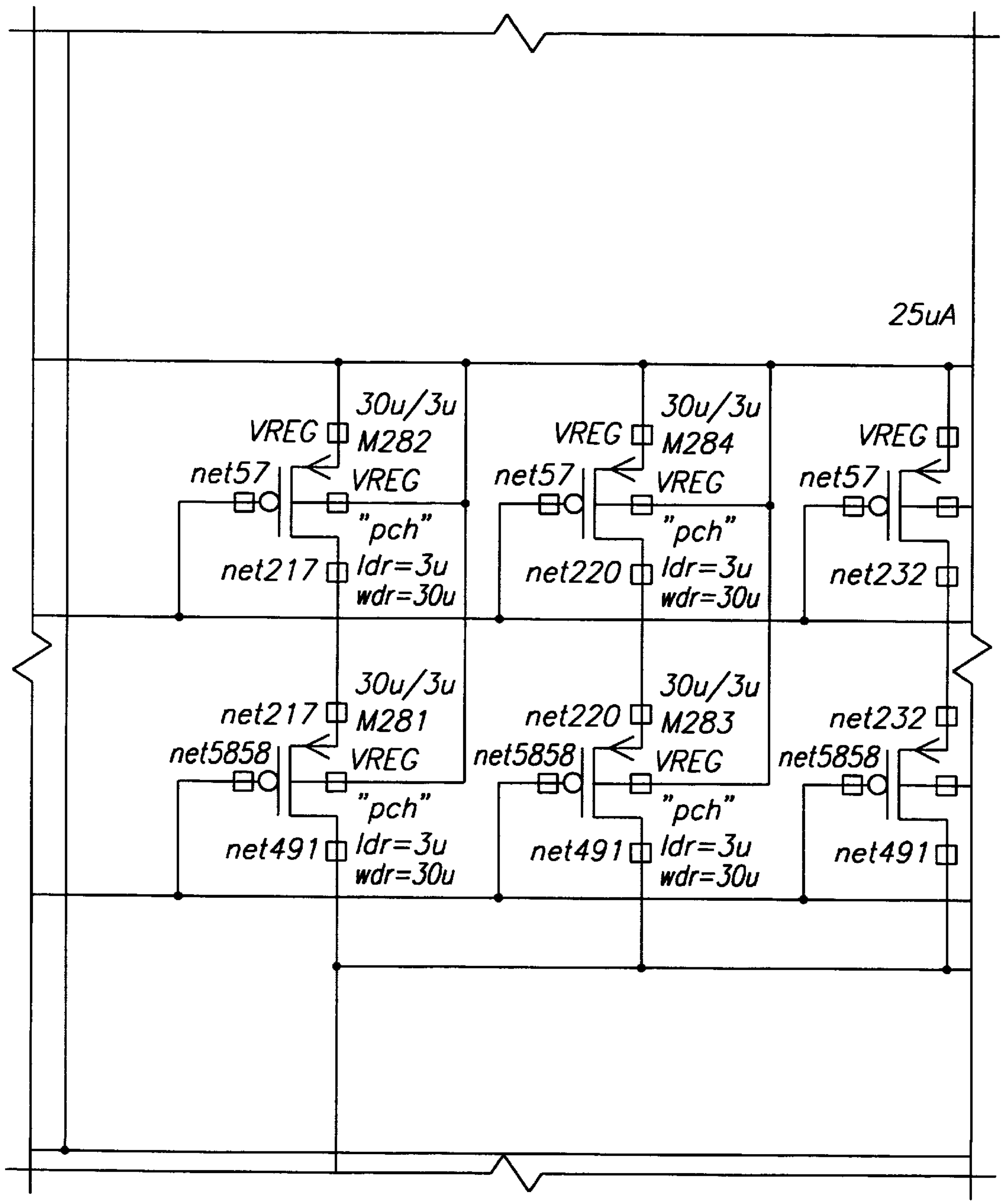
Fig. 8.0101EH

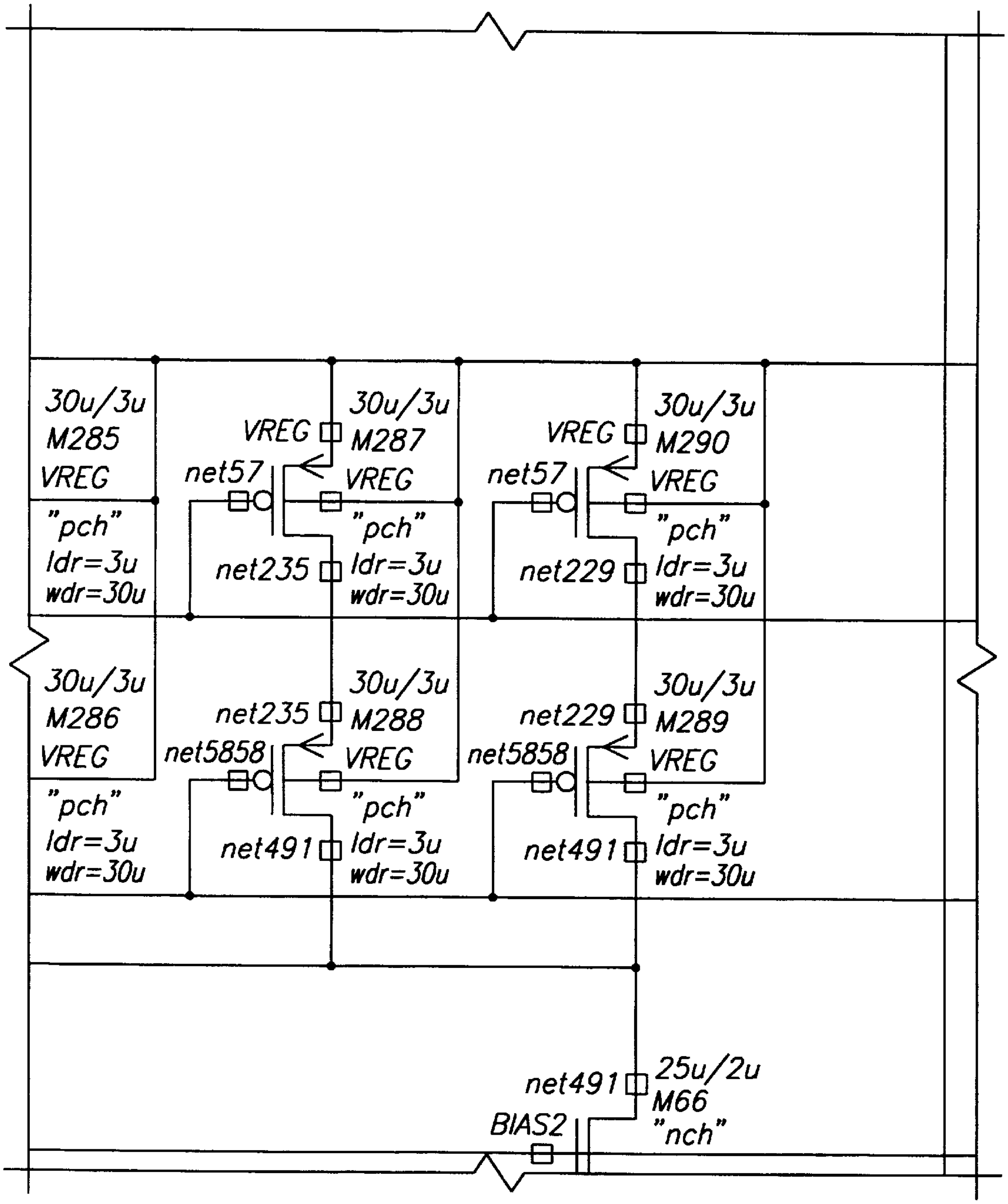
Fig 8.0107EI

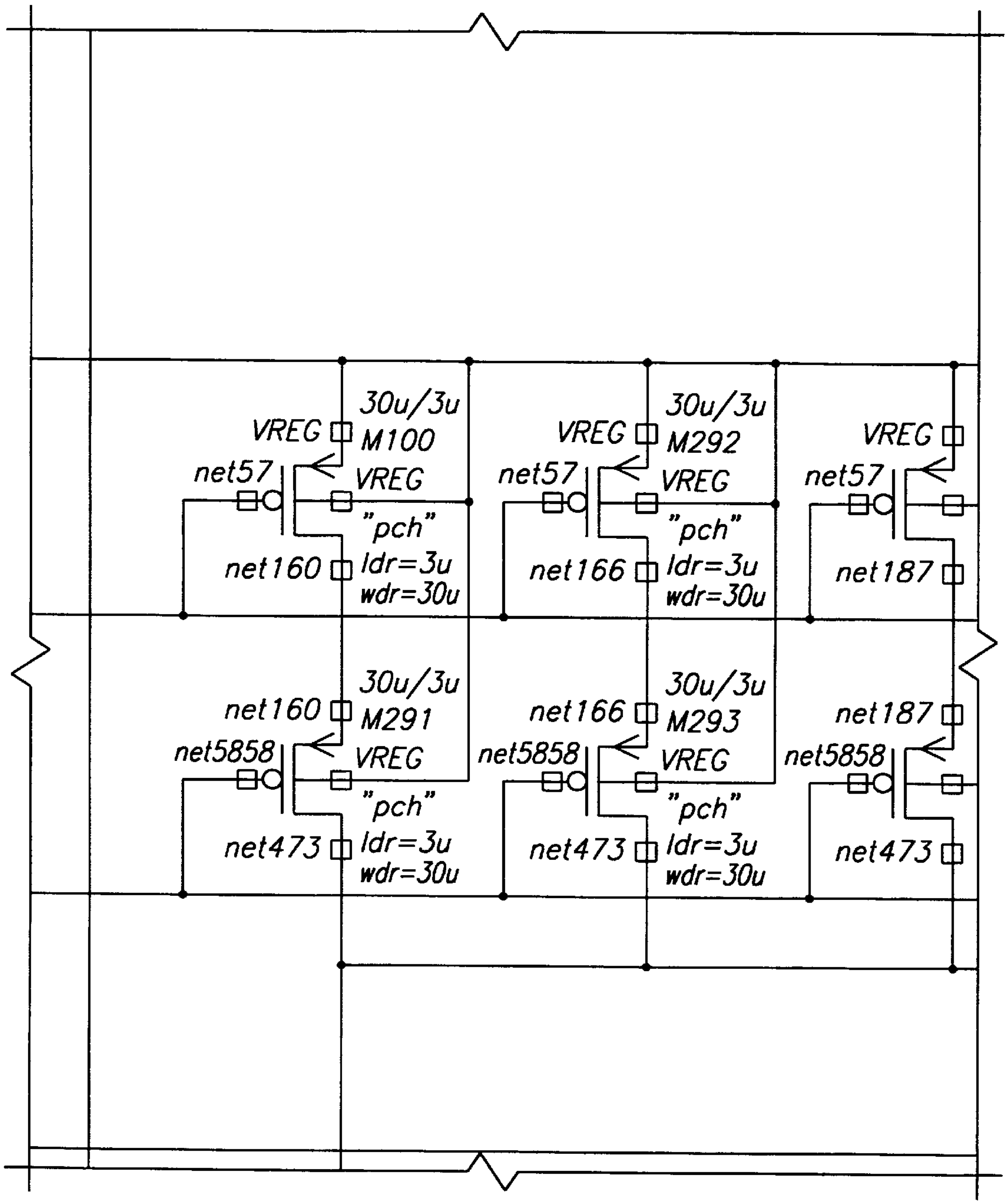
Fig 8.010Ea

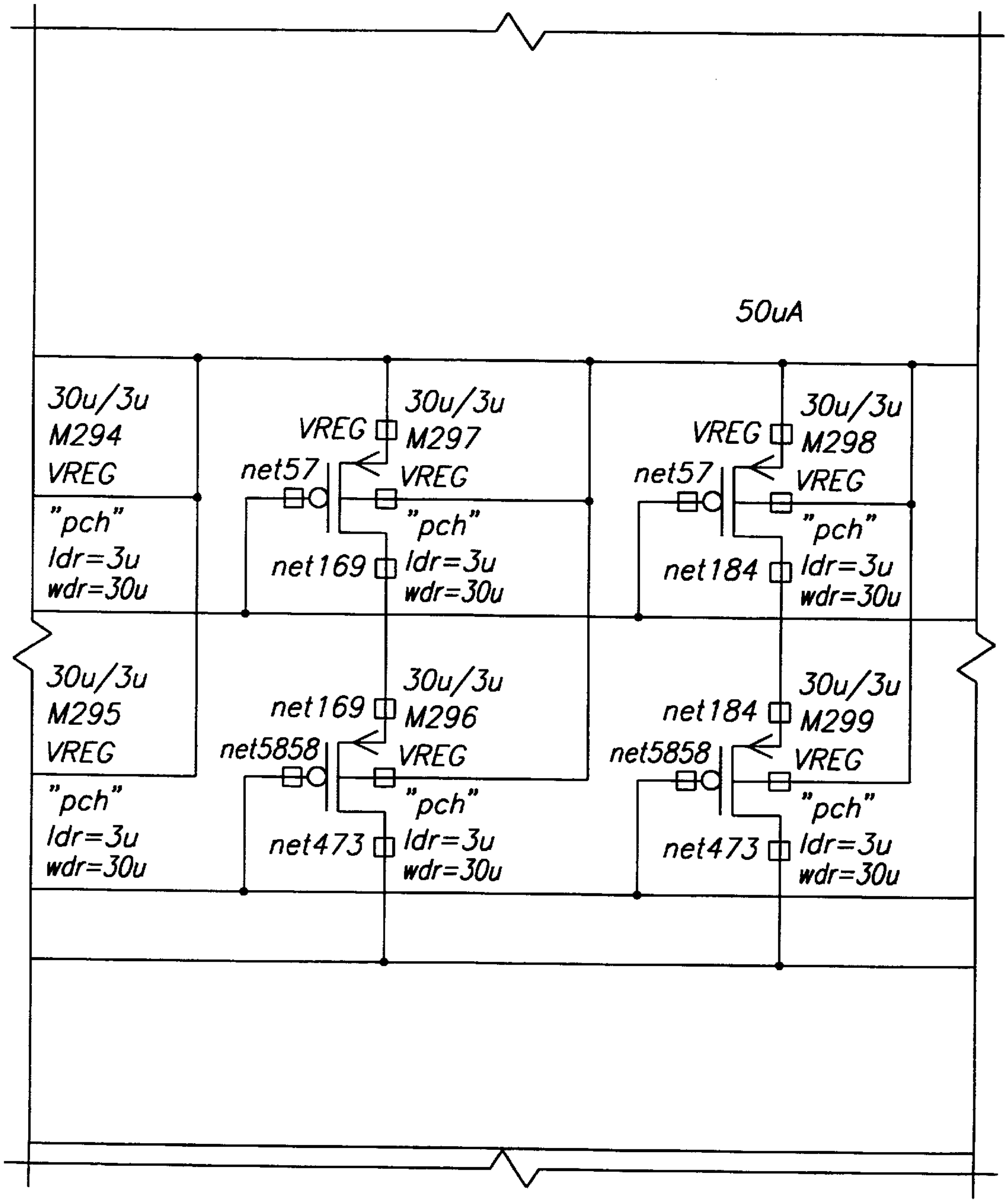
Fig 8.010IEK

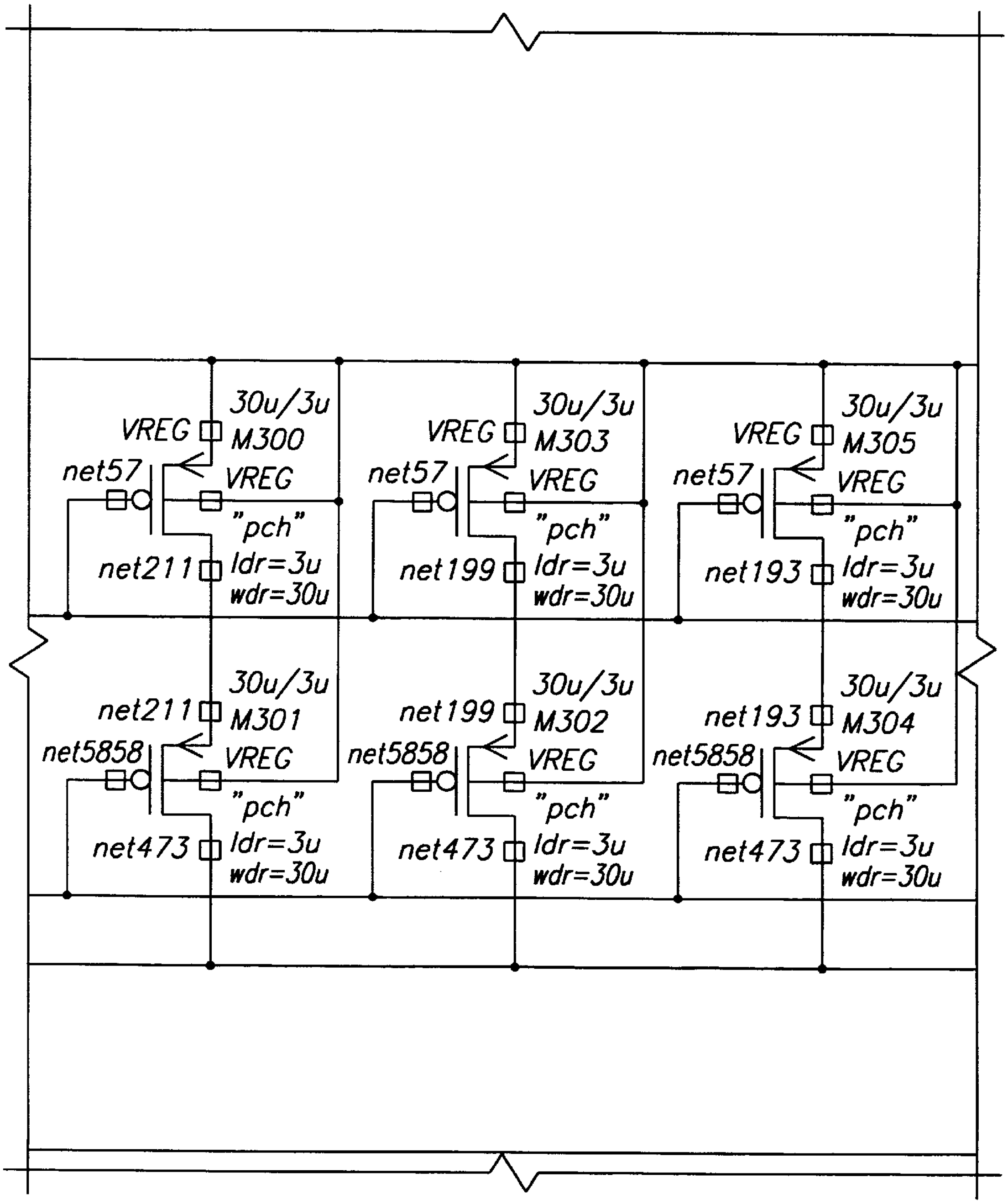
Fig. 8.0107EL

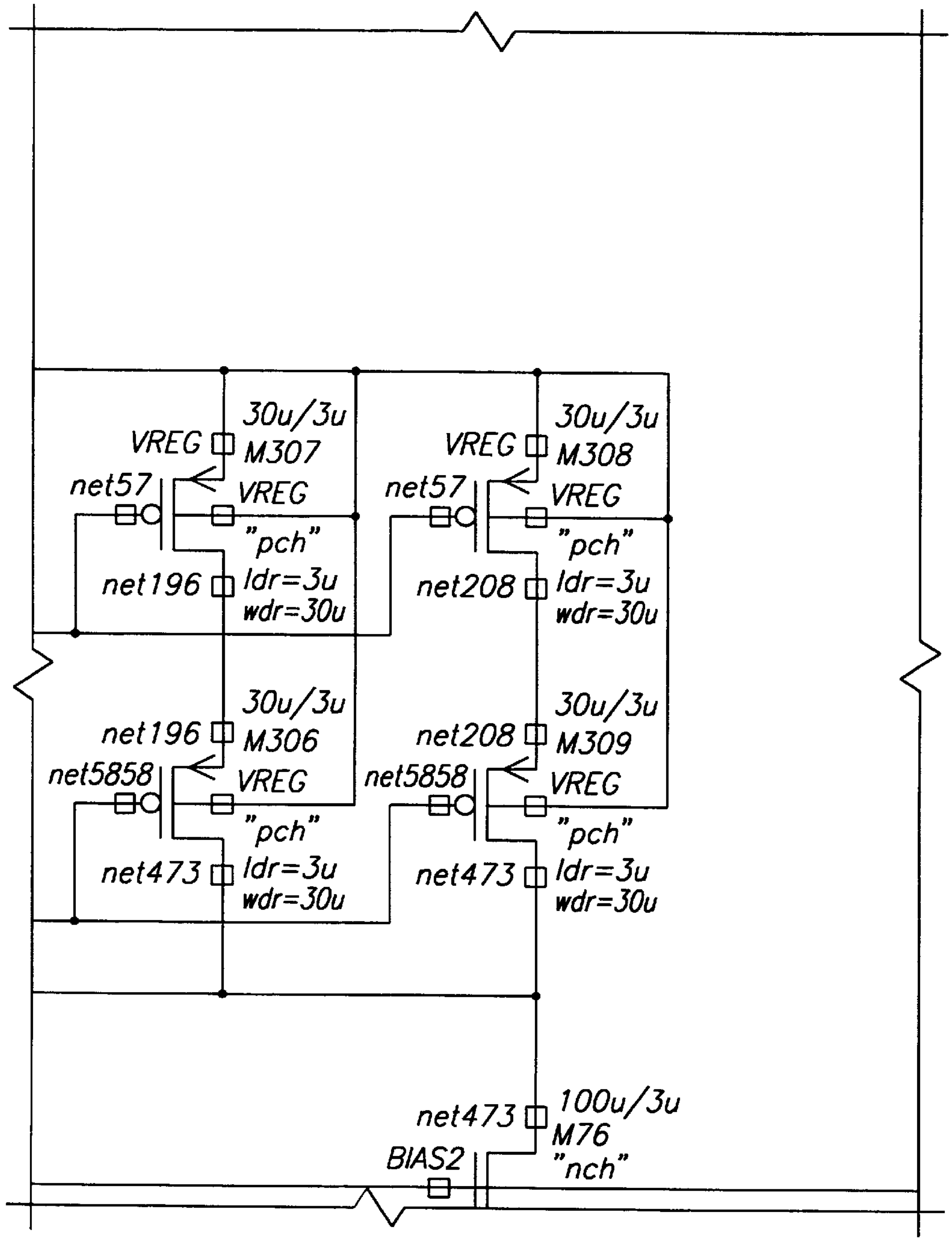
FIG. 8.010.10EM

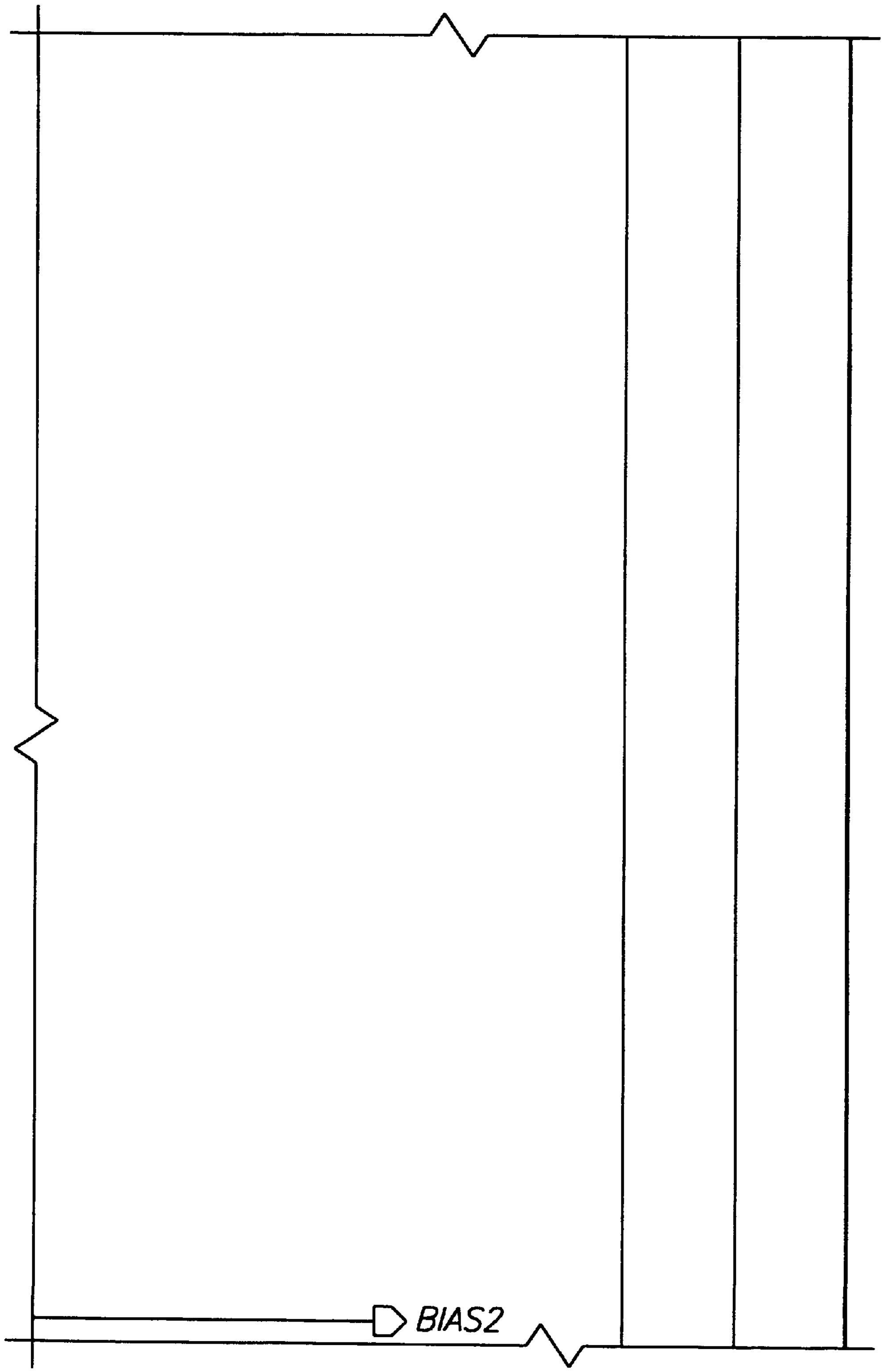
FIG 8.010IEN

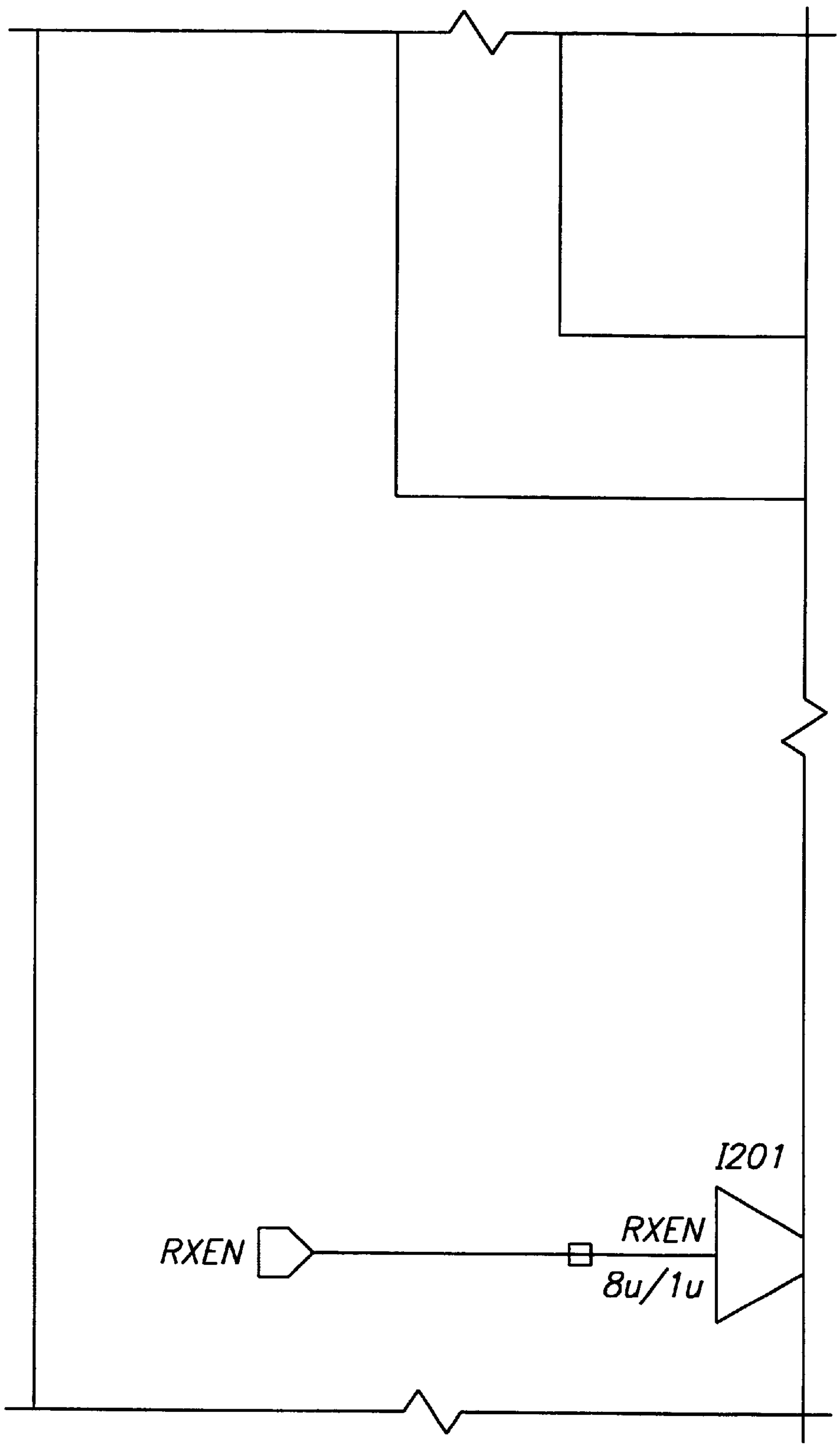
Fig. 8.0101FA

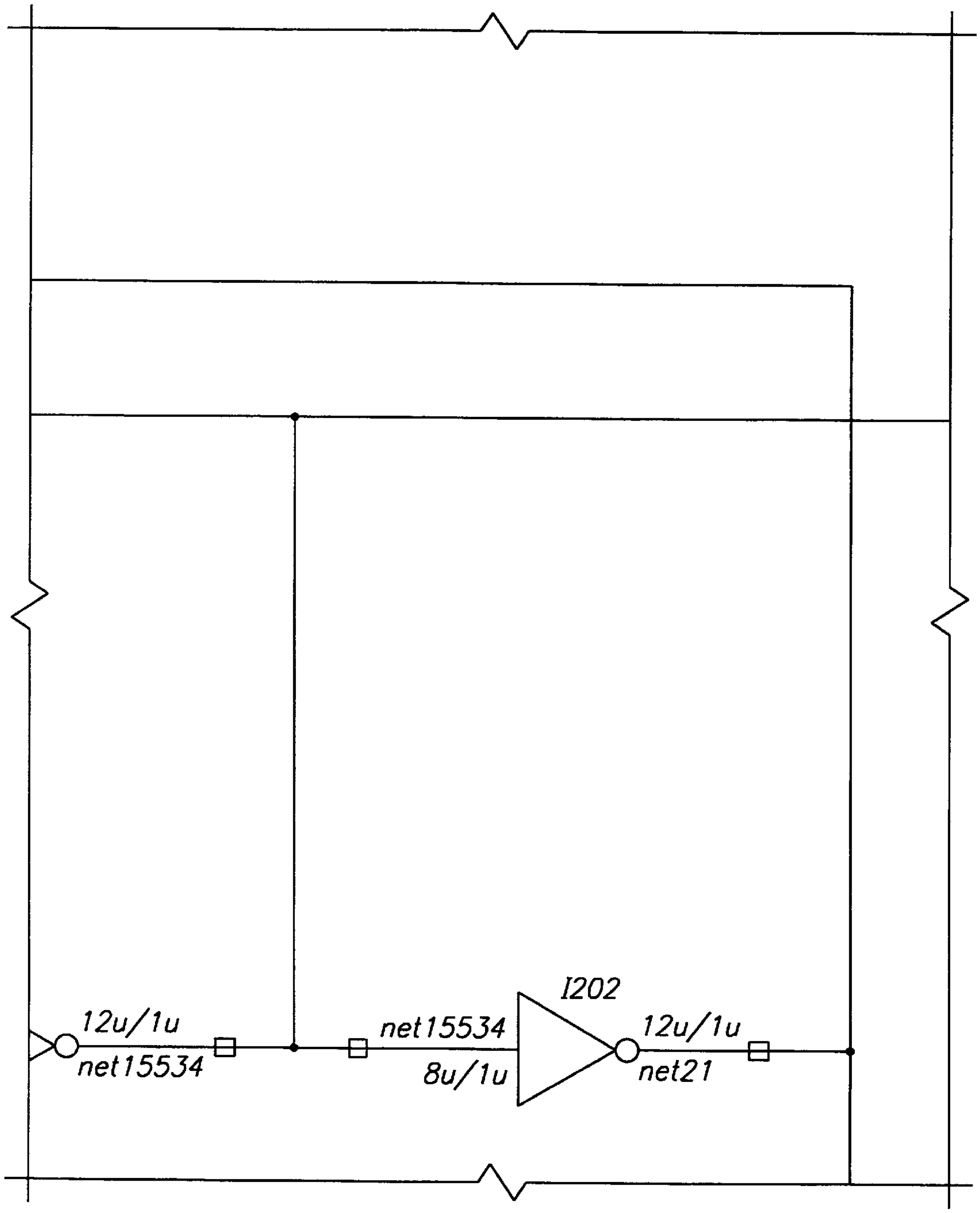
Fig 8.0107FB

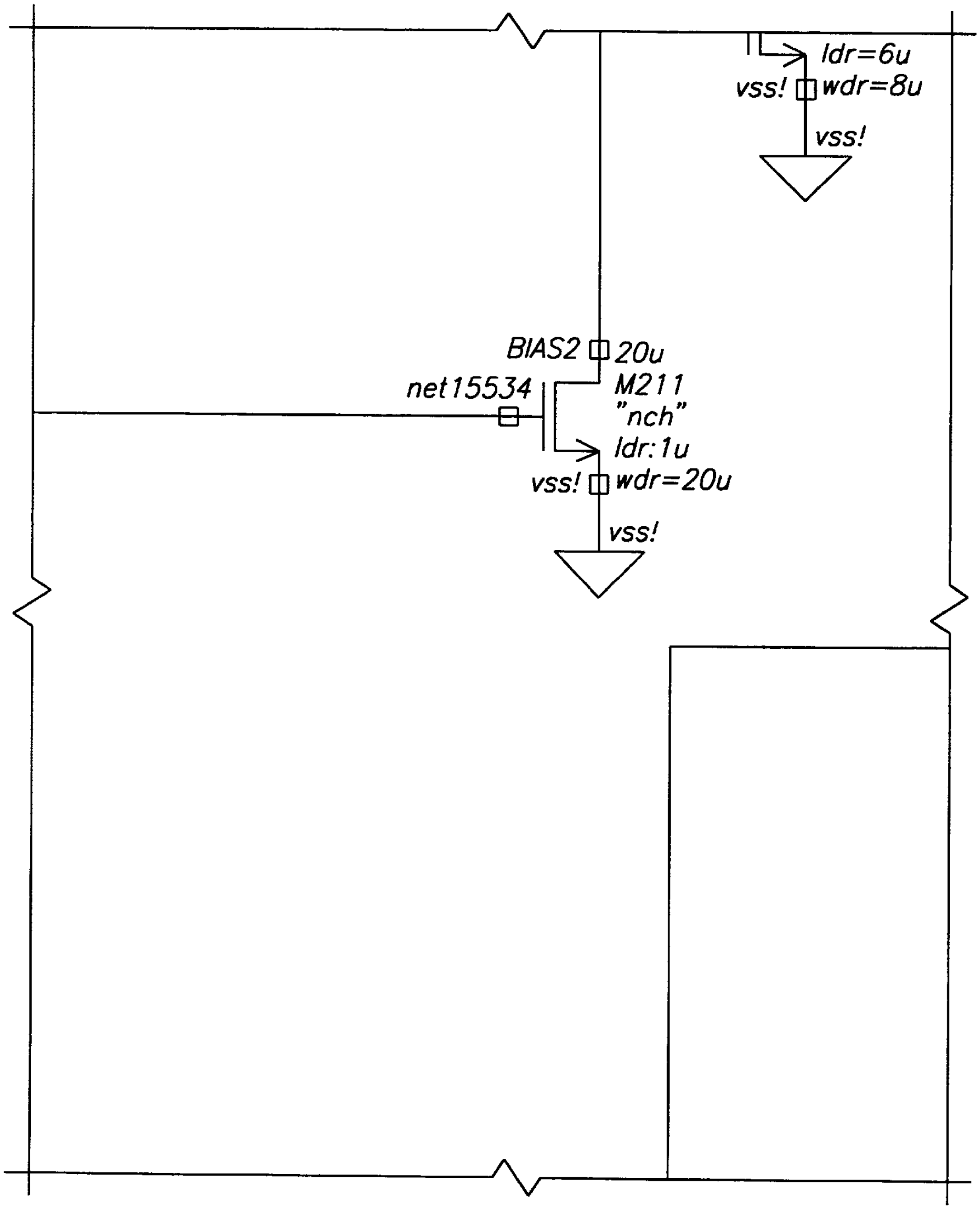
Fig 8.0107FC

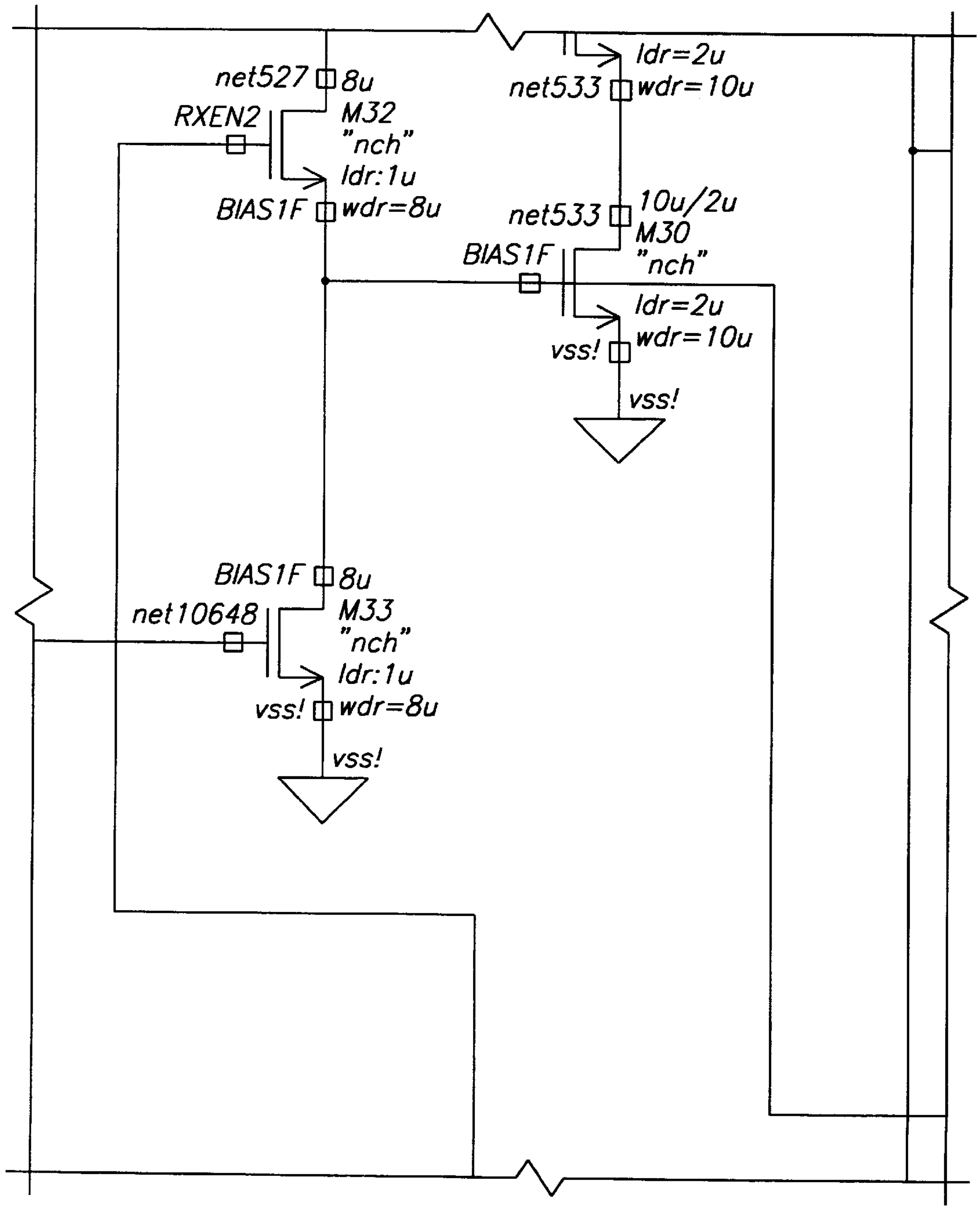
Fig 8.0107FD

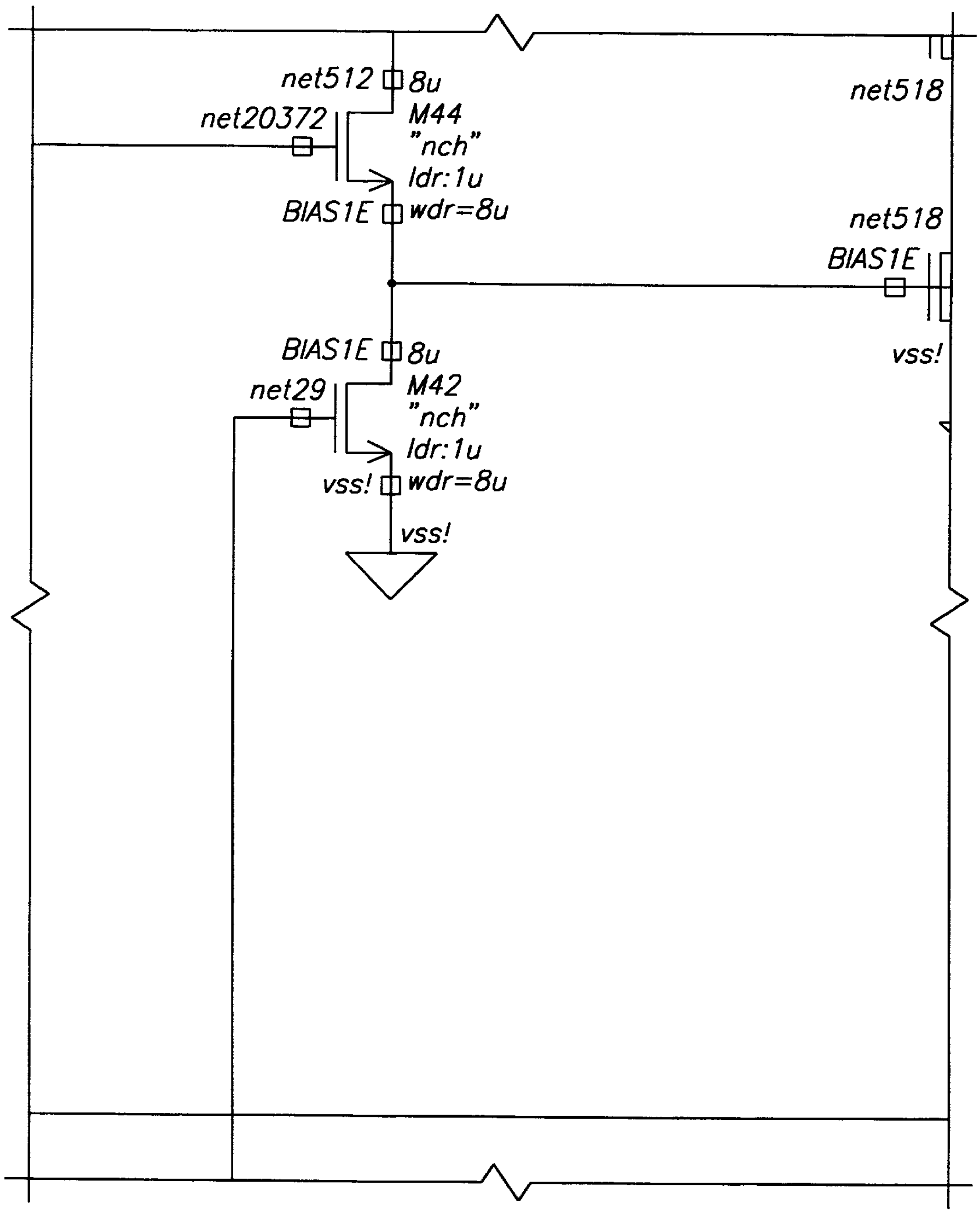
Fig 8.0107FE

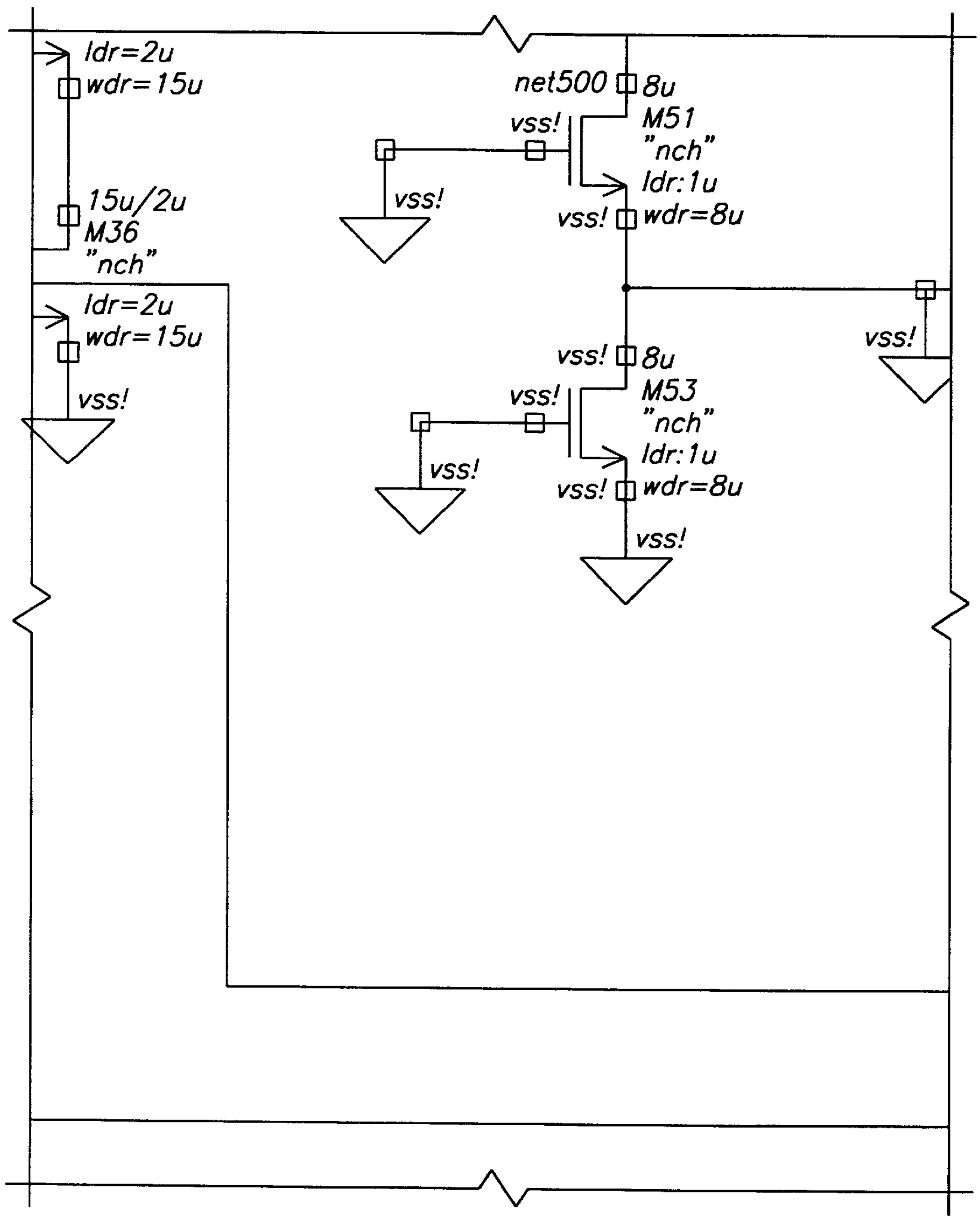
Fig 8.0107FF

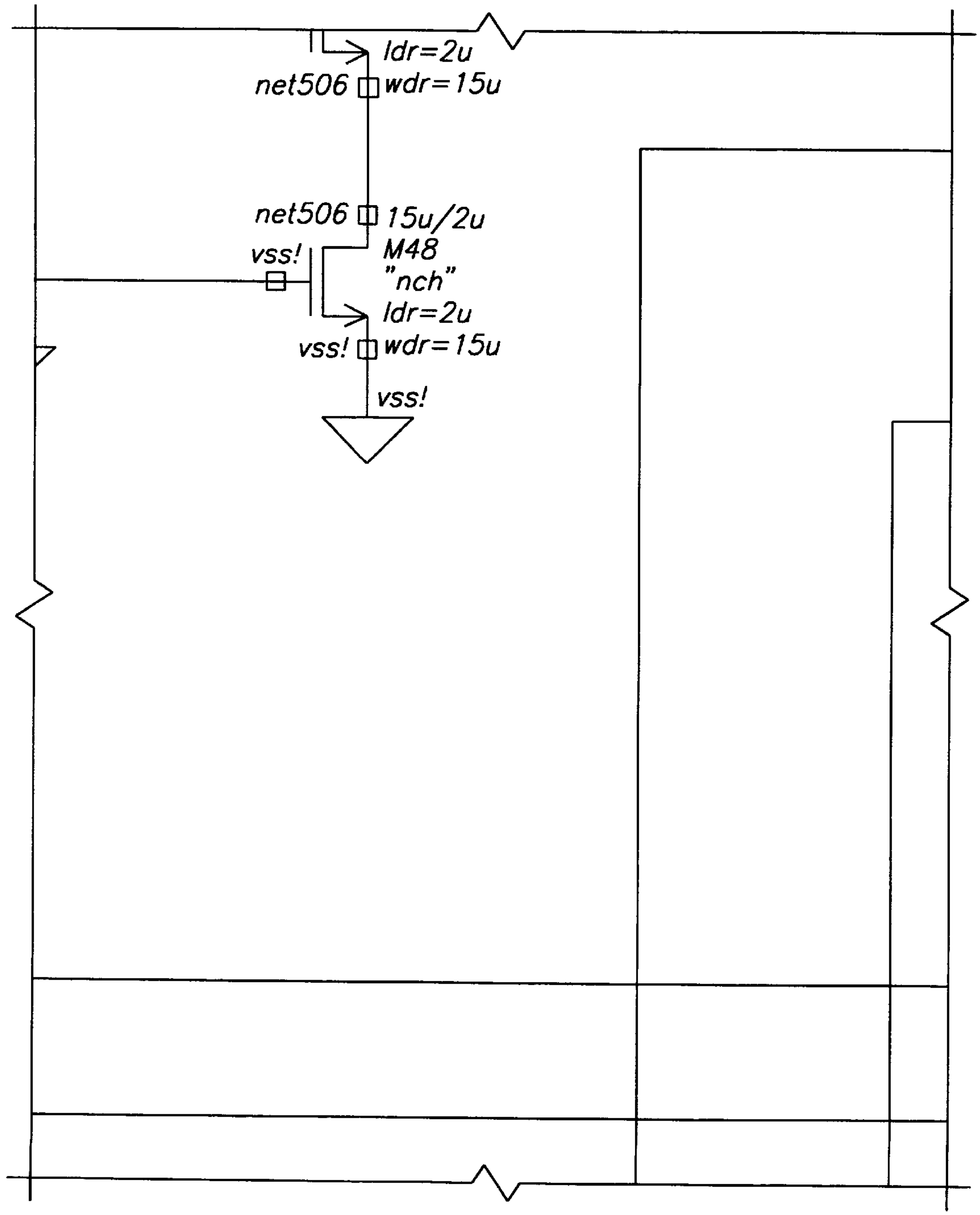
Fig 8.0107FG

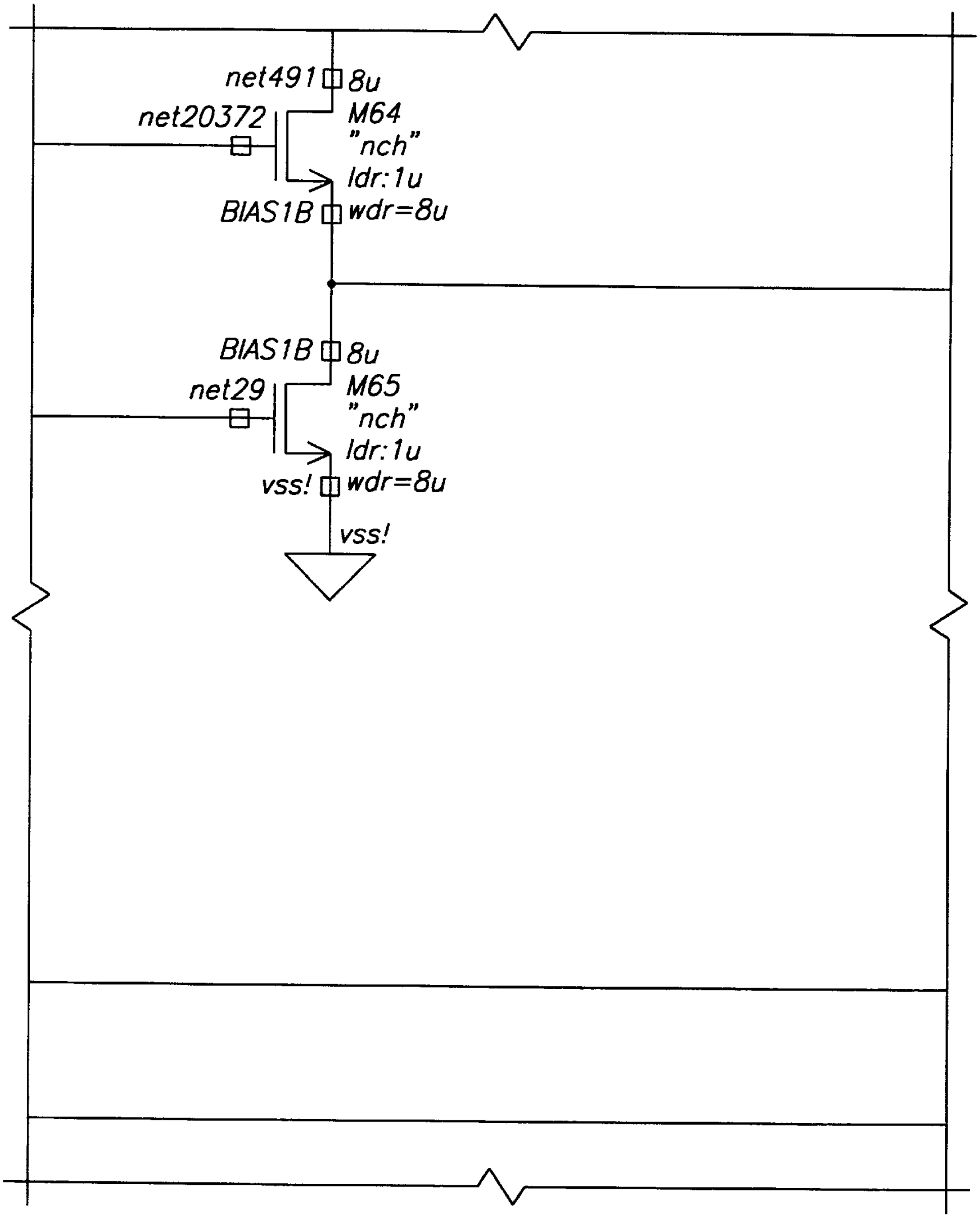
Fig. 8.0107FH

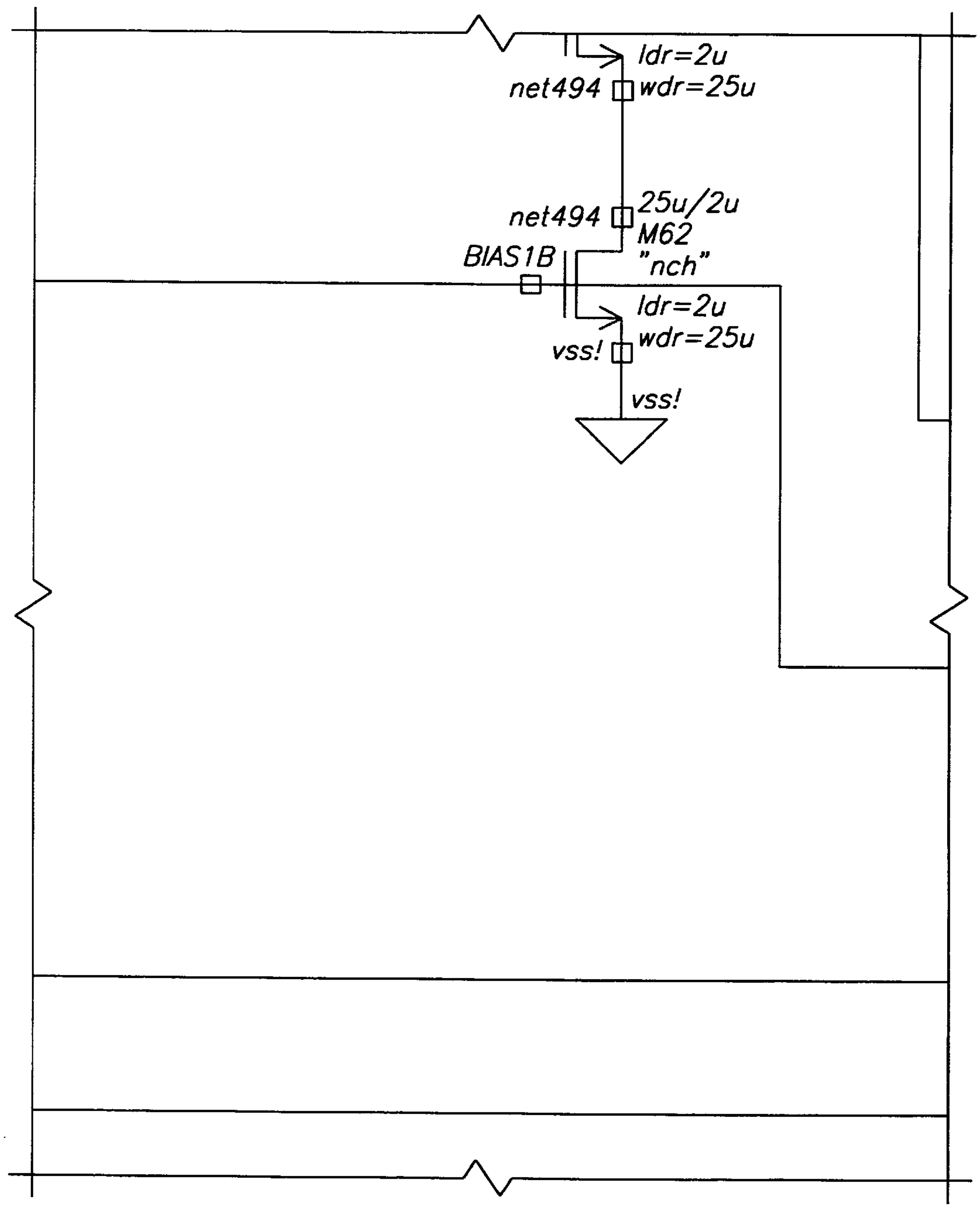
Fig 8.0101FI

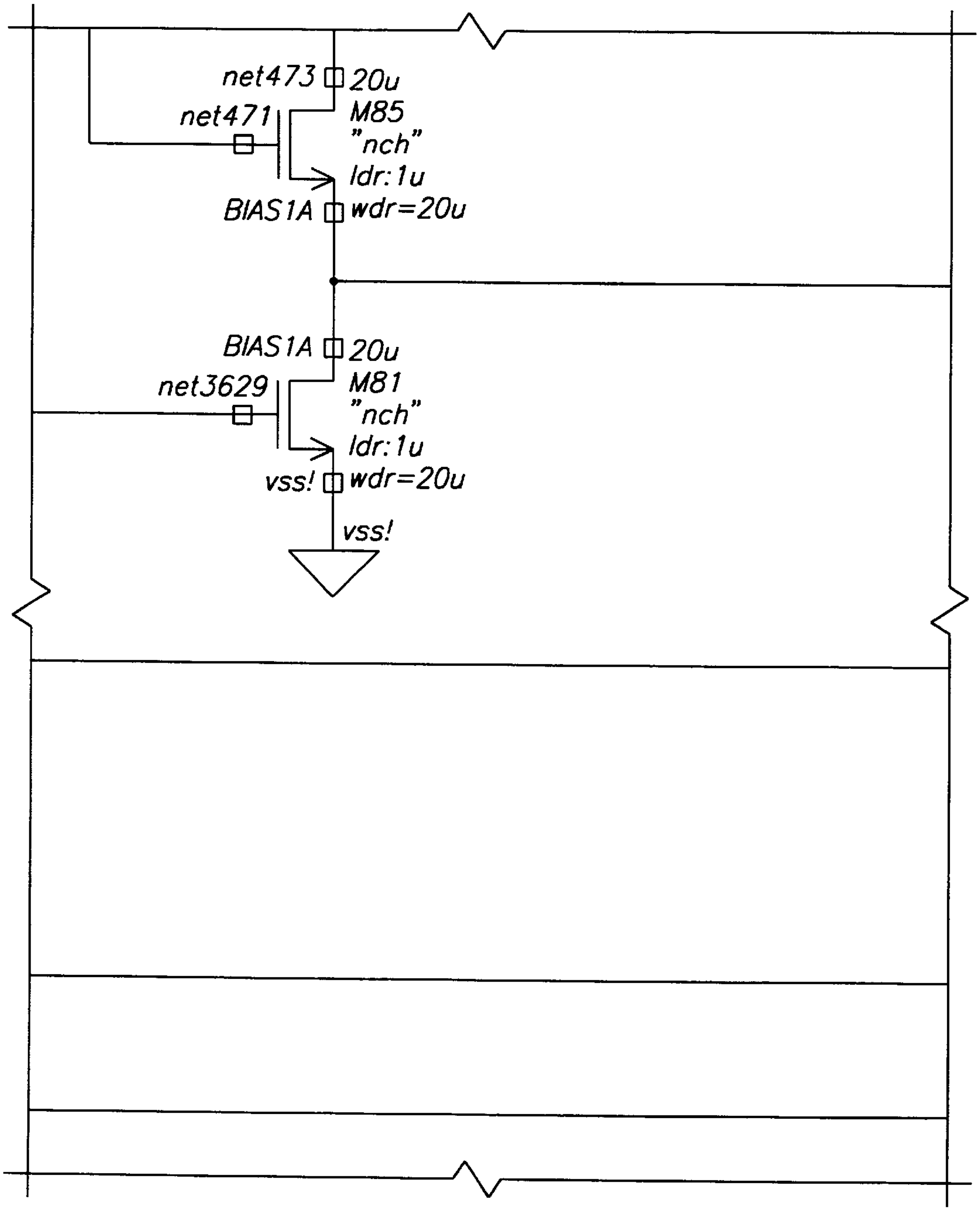
FIG. 8.107Fd

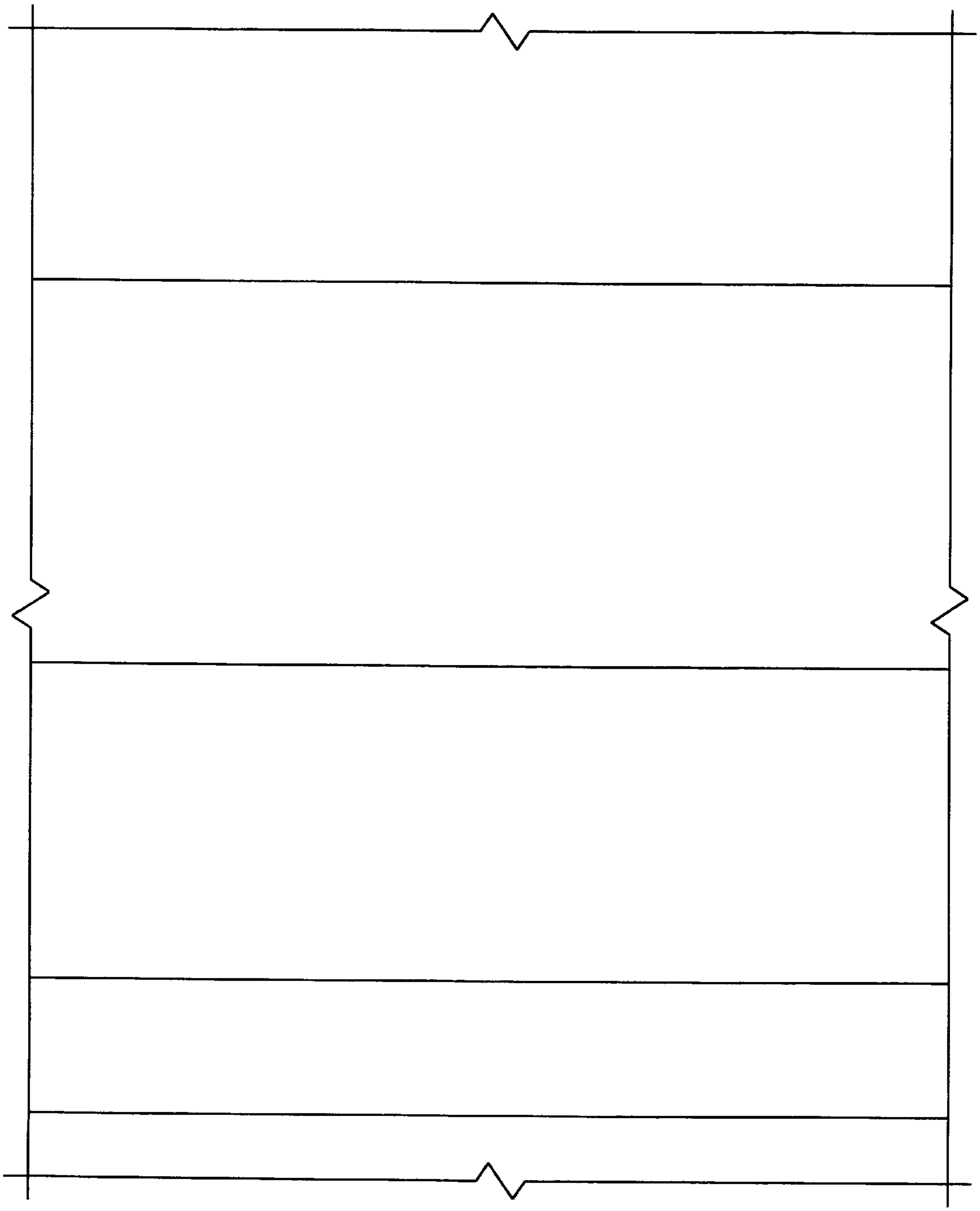
Fig 8.0107FK

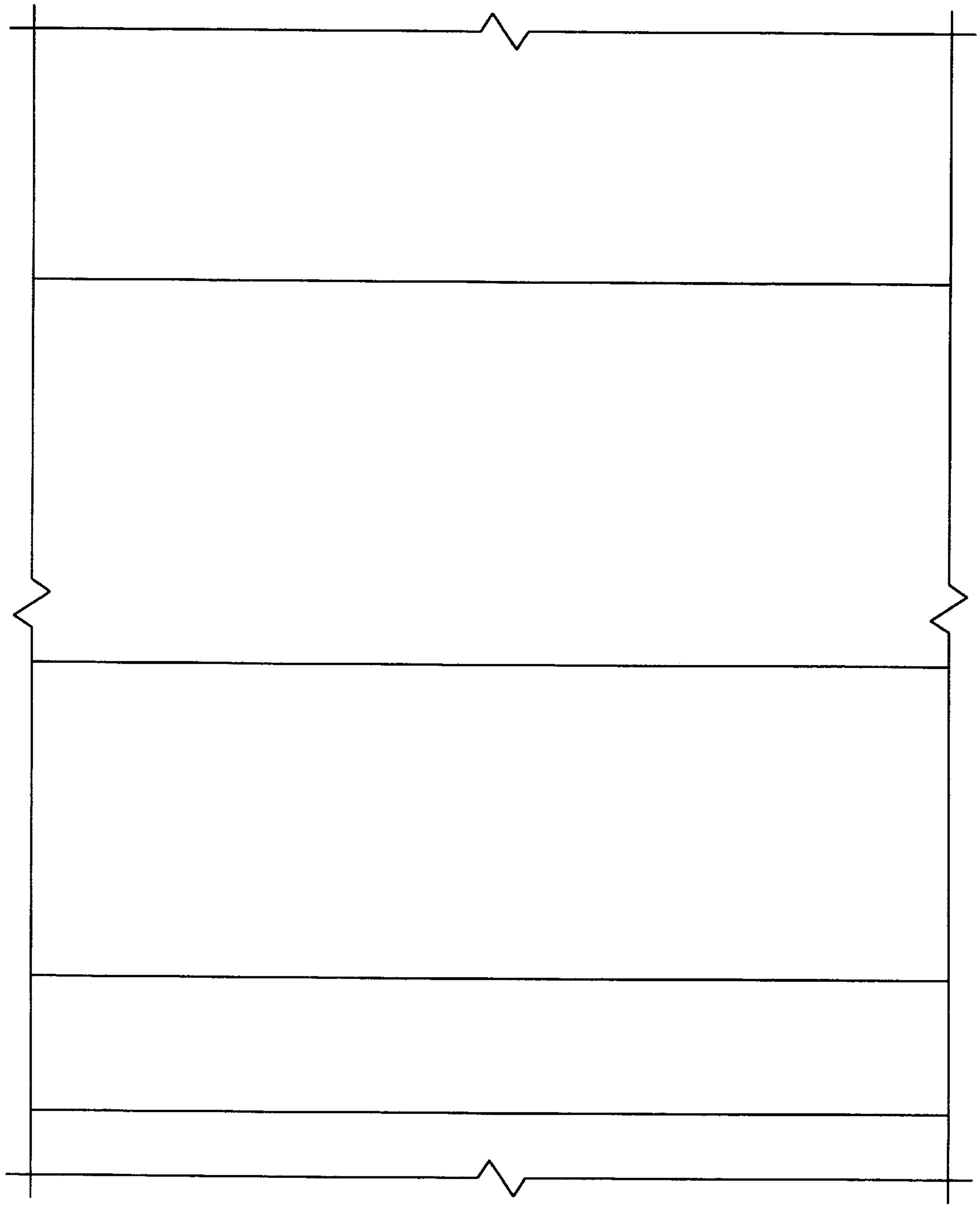
Fig 8.0107FL

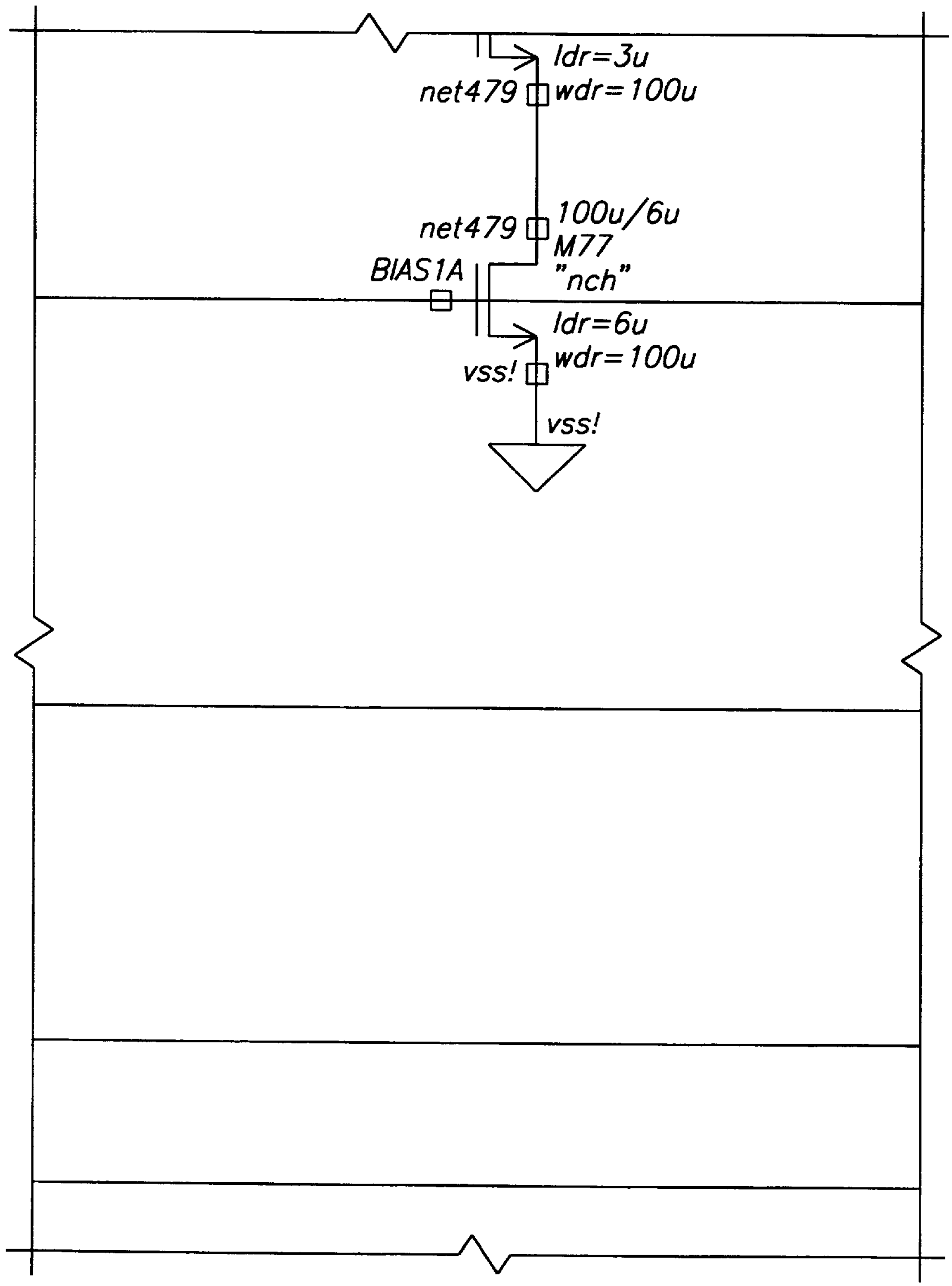
FIG. 8.010.10FM

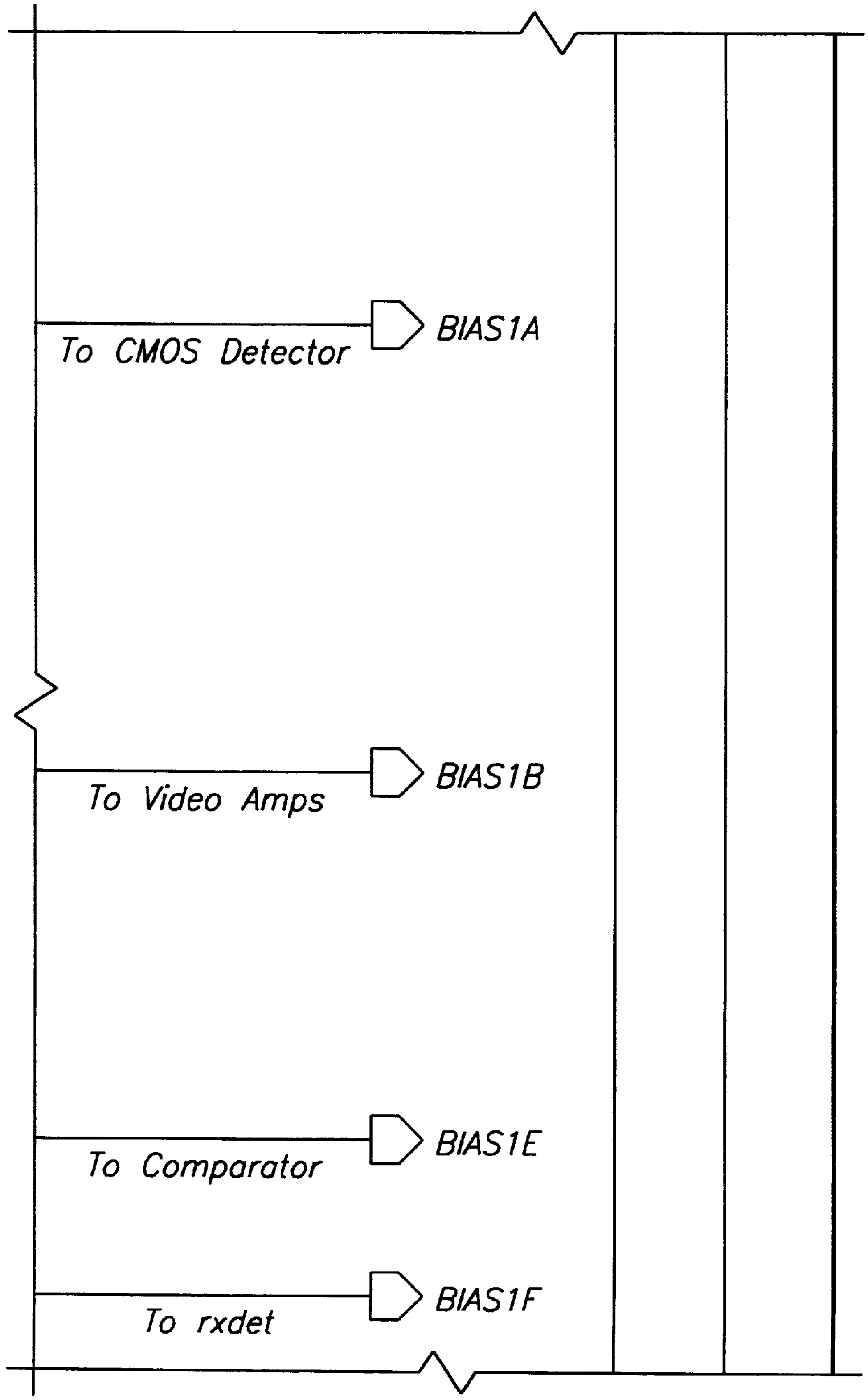
Fig 8.010.1FN

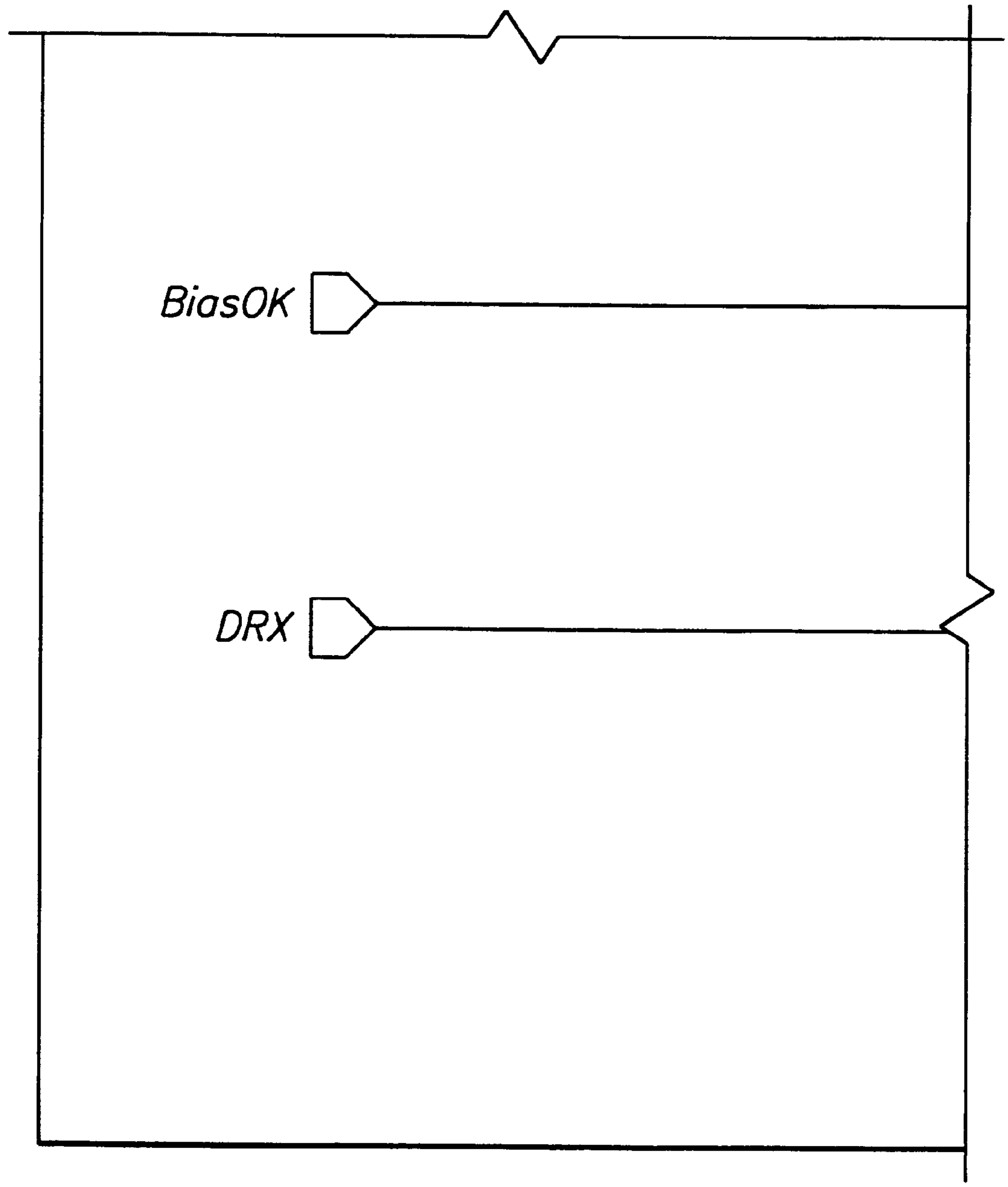
Fig 8.0107GA

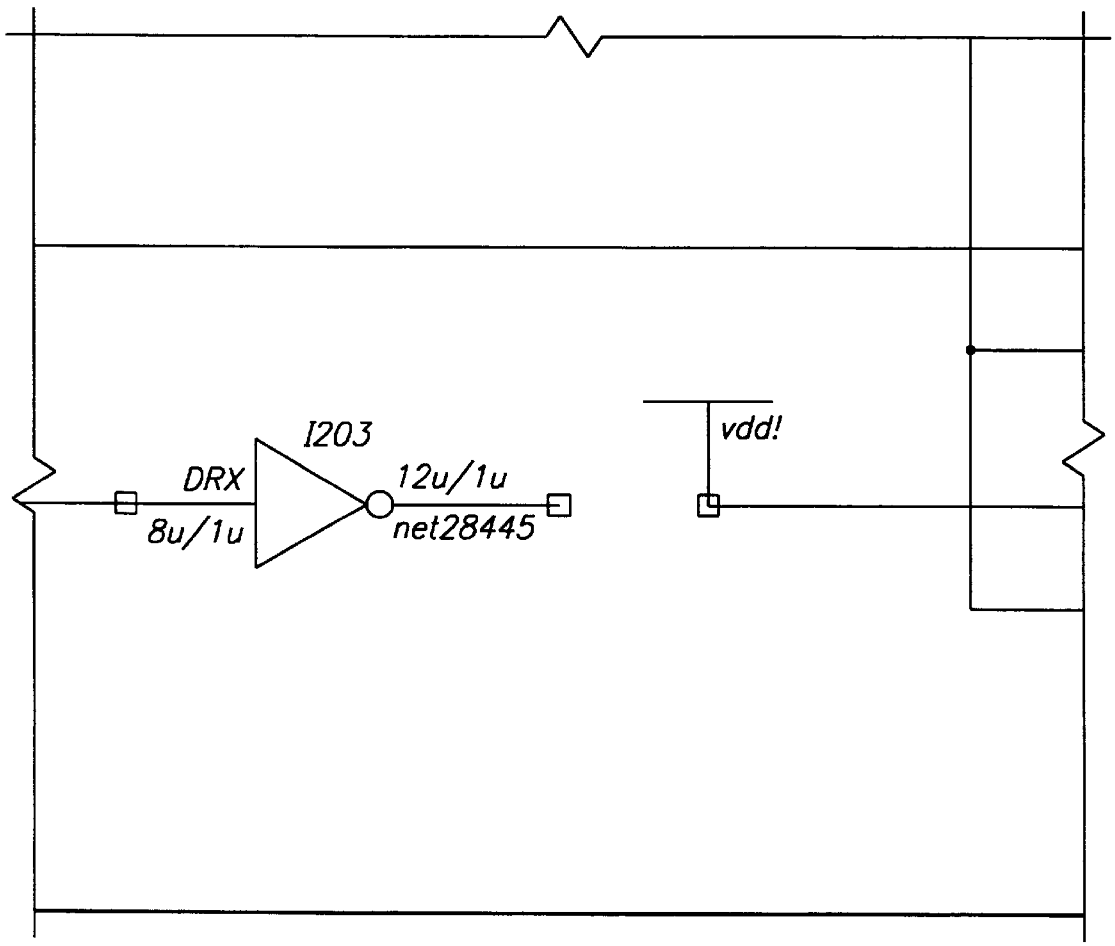
Fig 8.0107GB

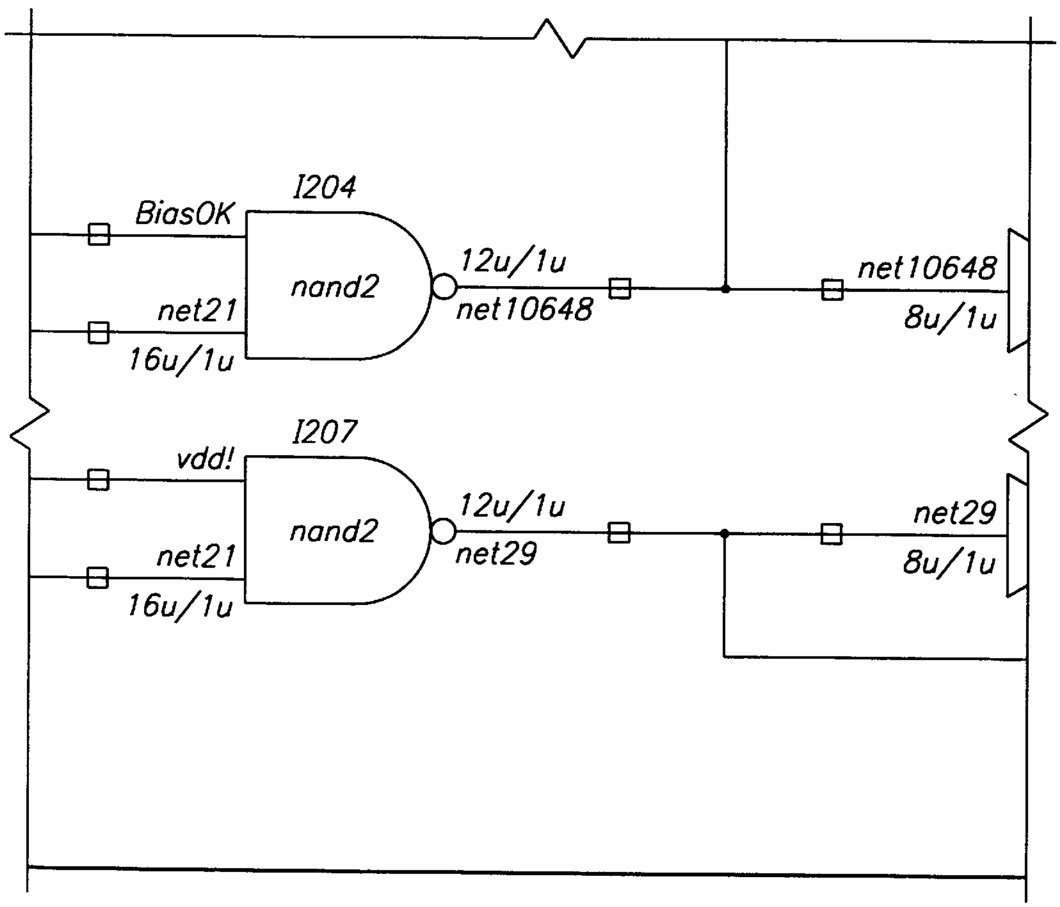
Fig 8.0107GC

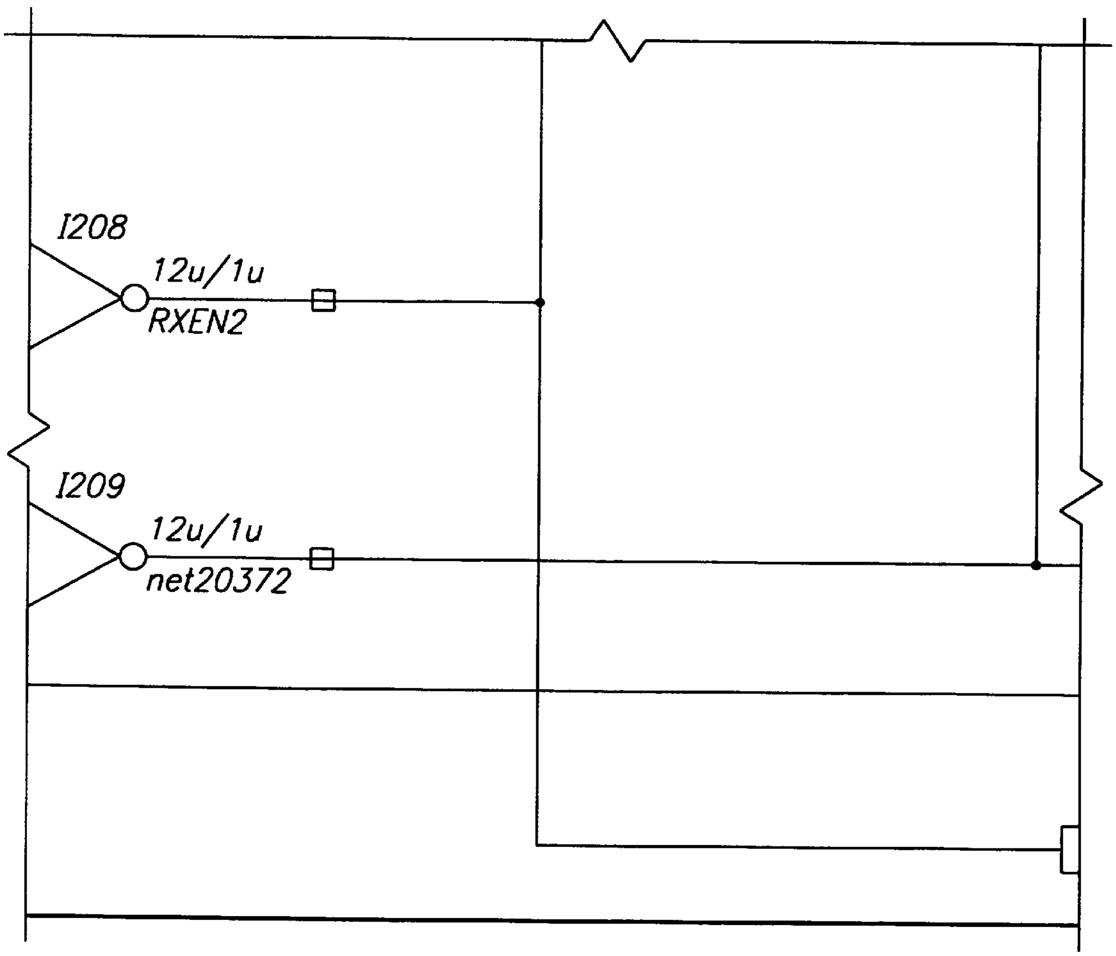
Fig 8.0107GD

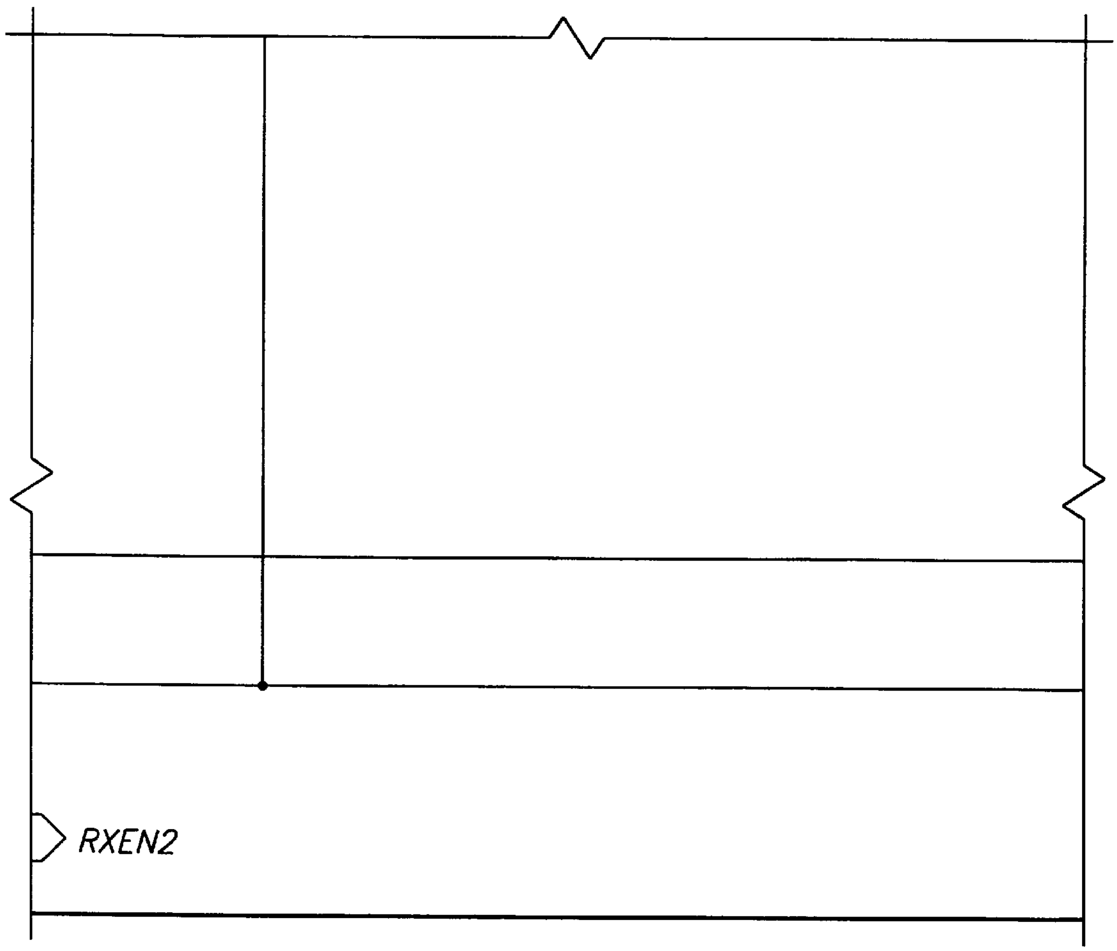
Fig 8.0107GE

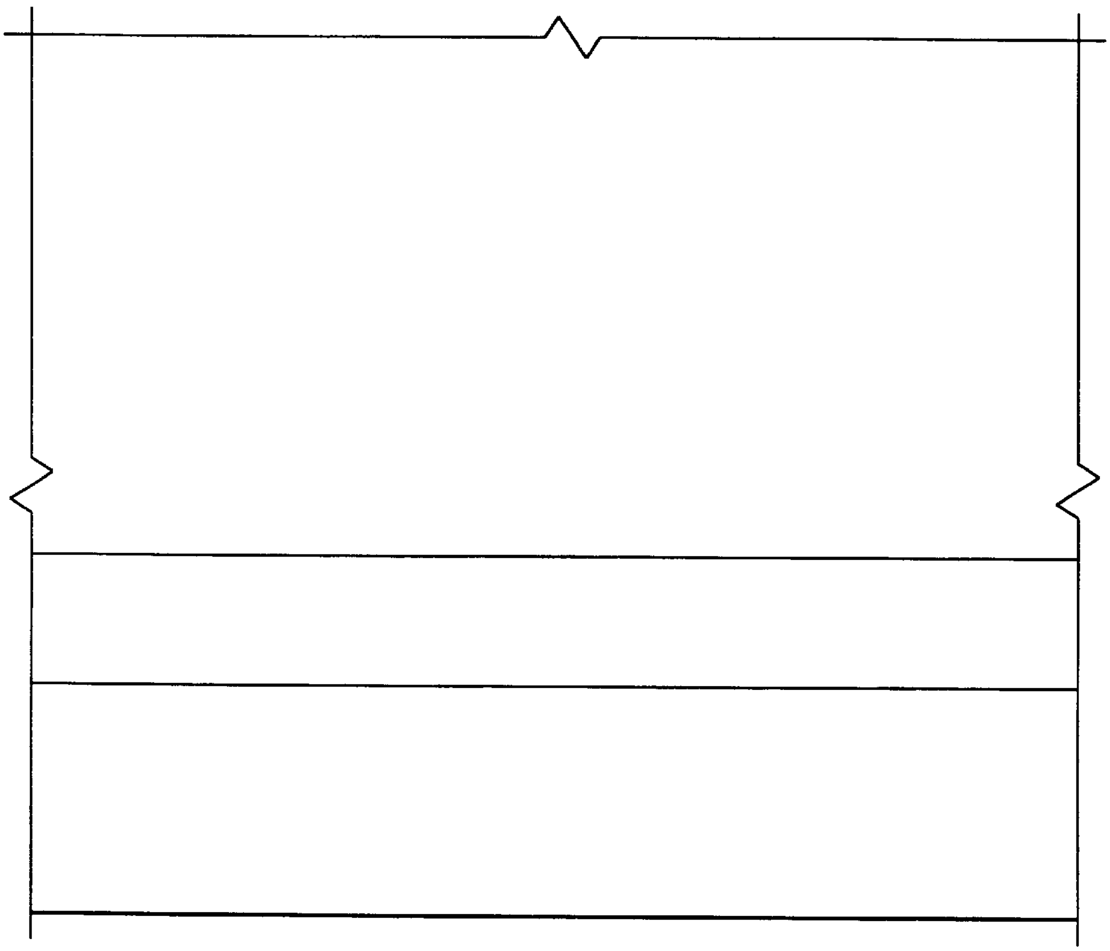
Fig 8.0107GF

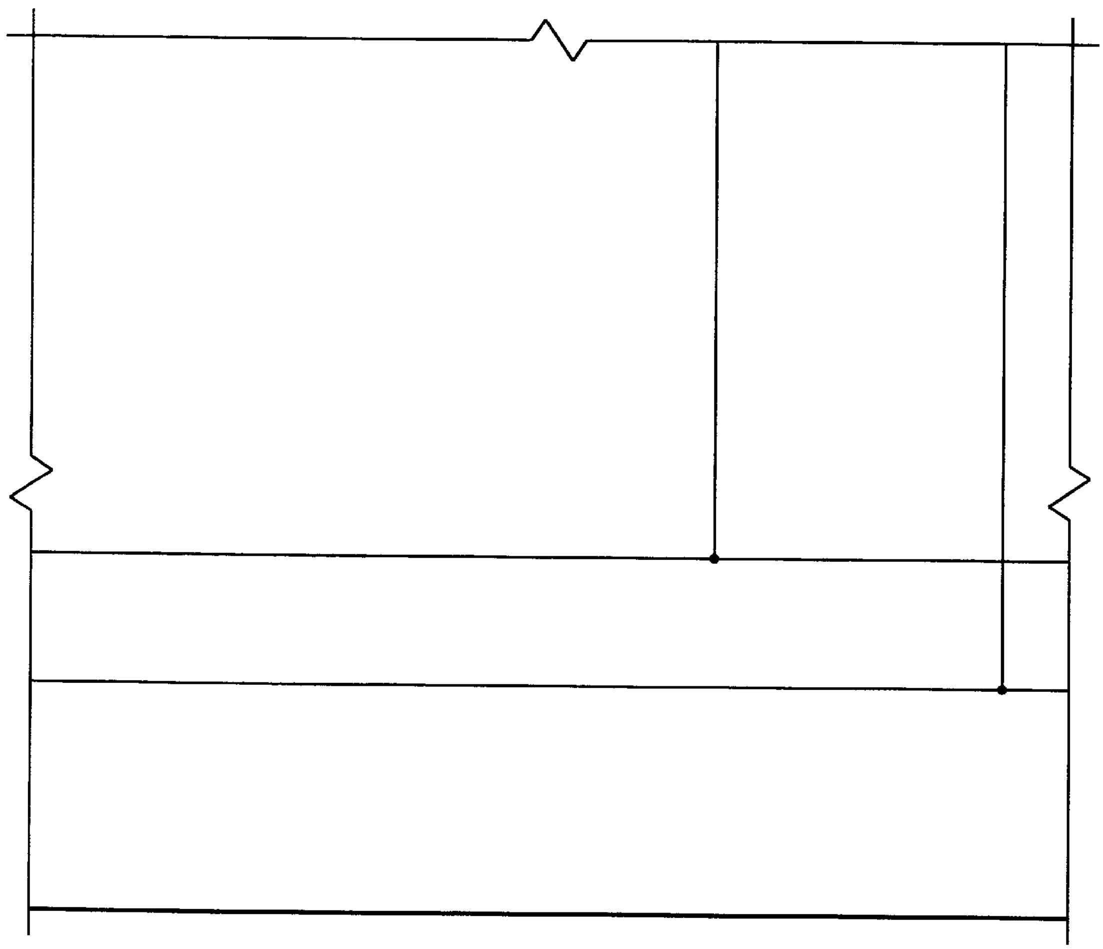
Fig 8.0107GG

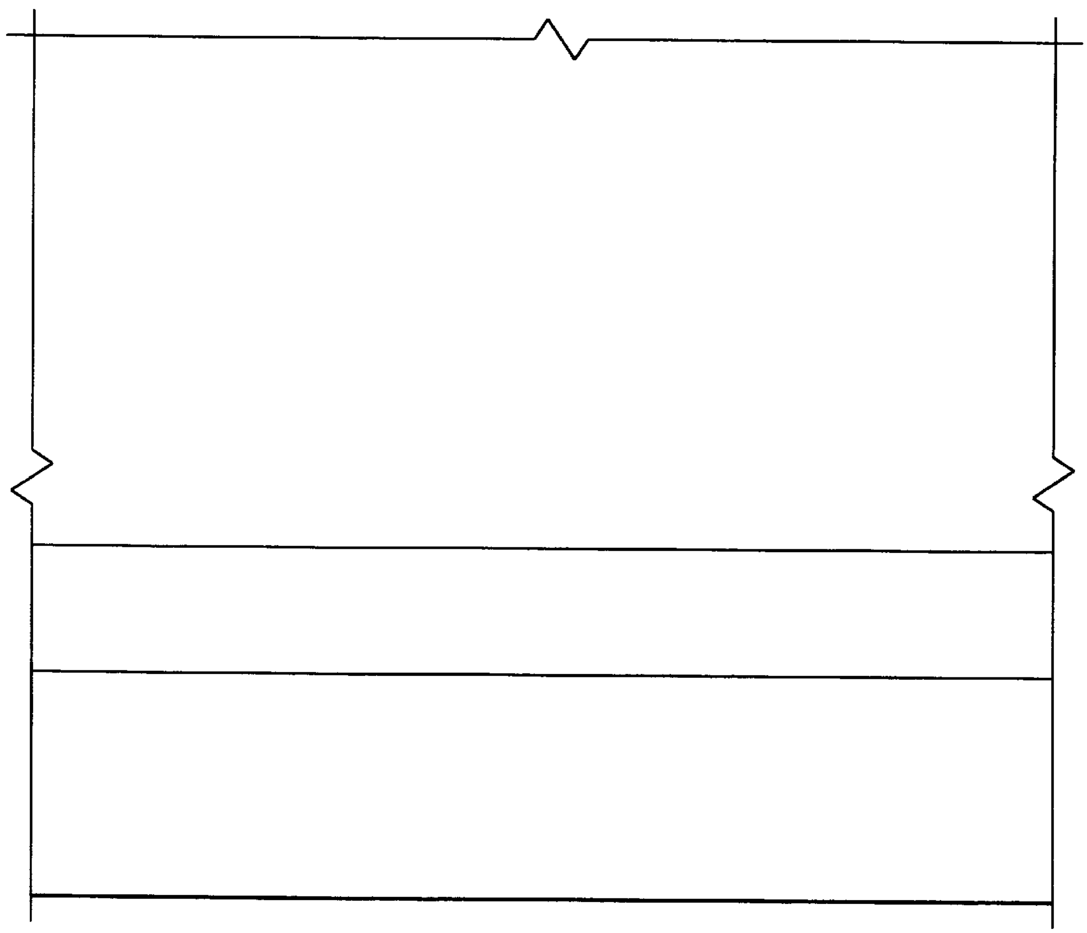
Fig 8.0107GH

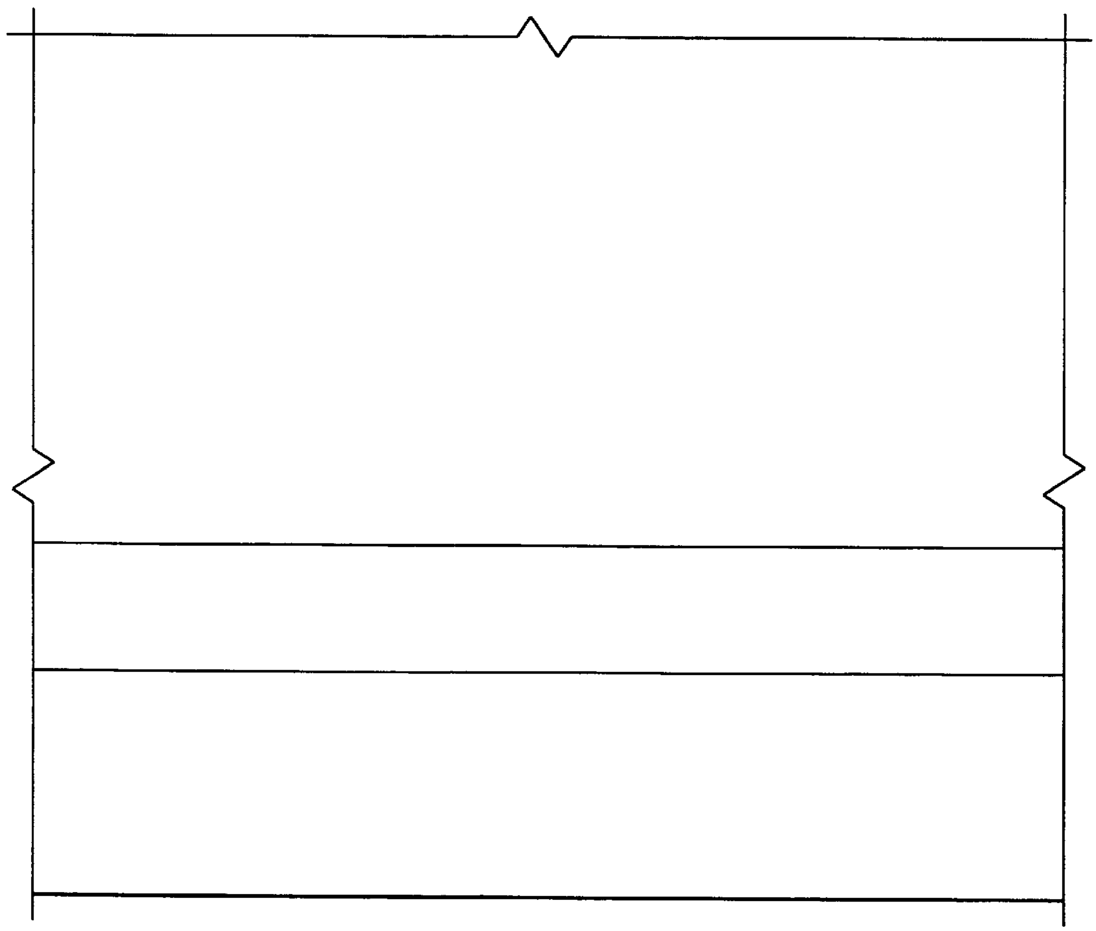
Fig 8.0107GI

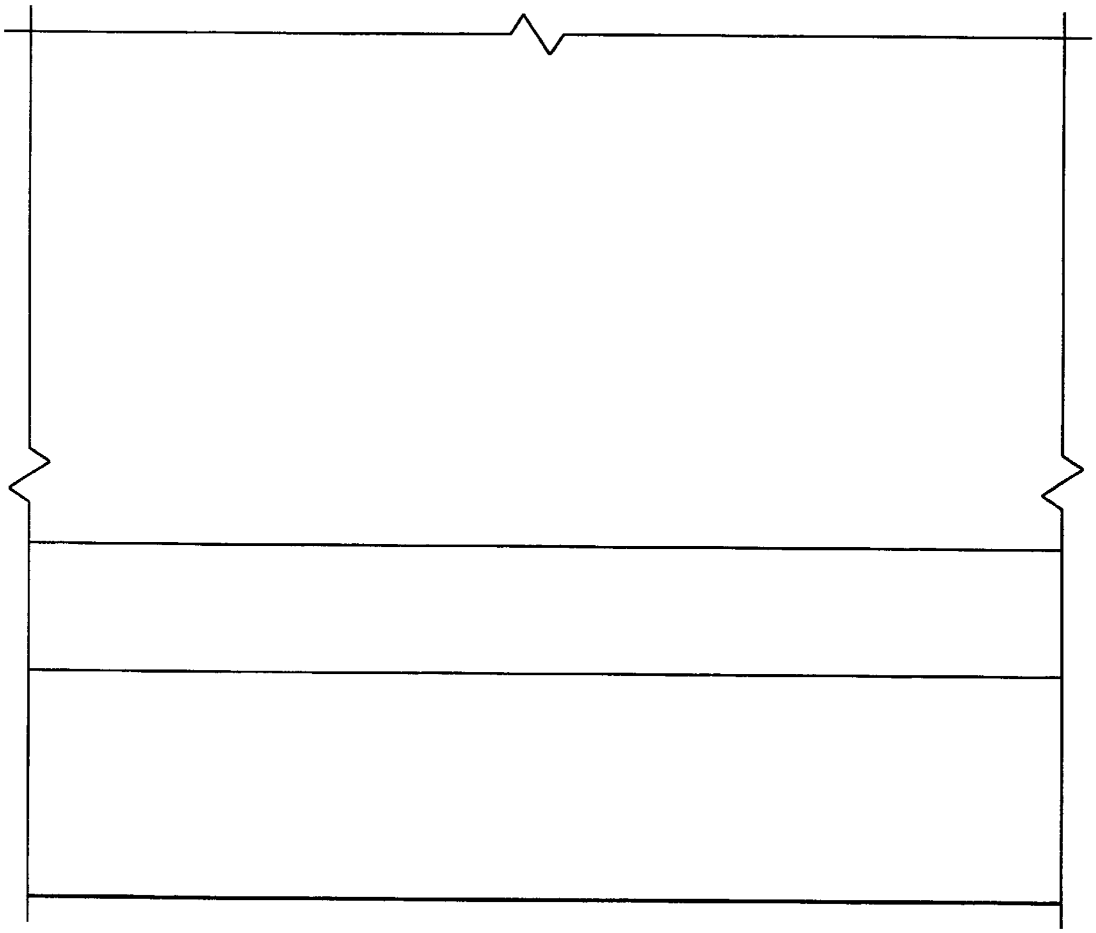
Fig. 8.01071Ga1

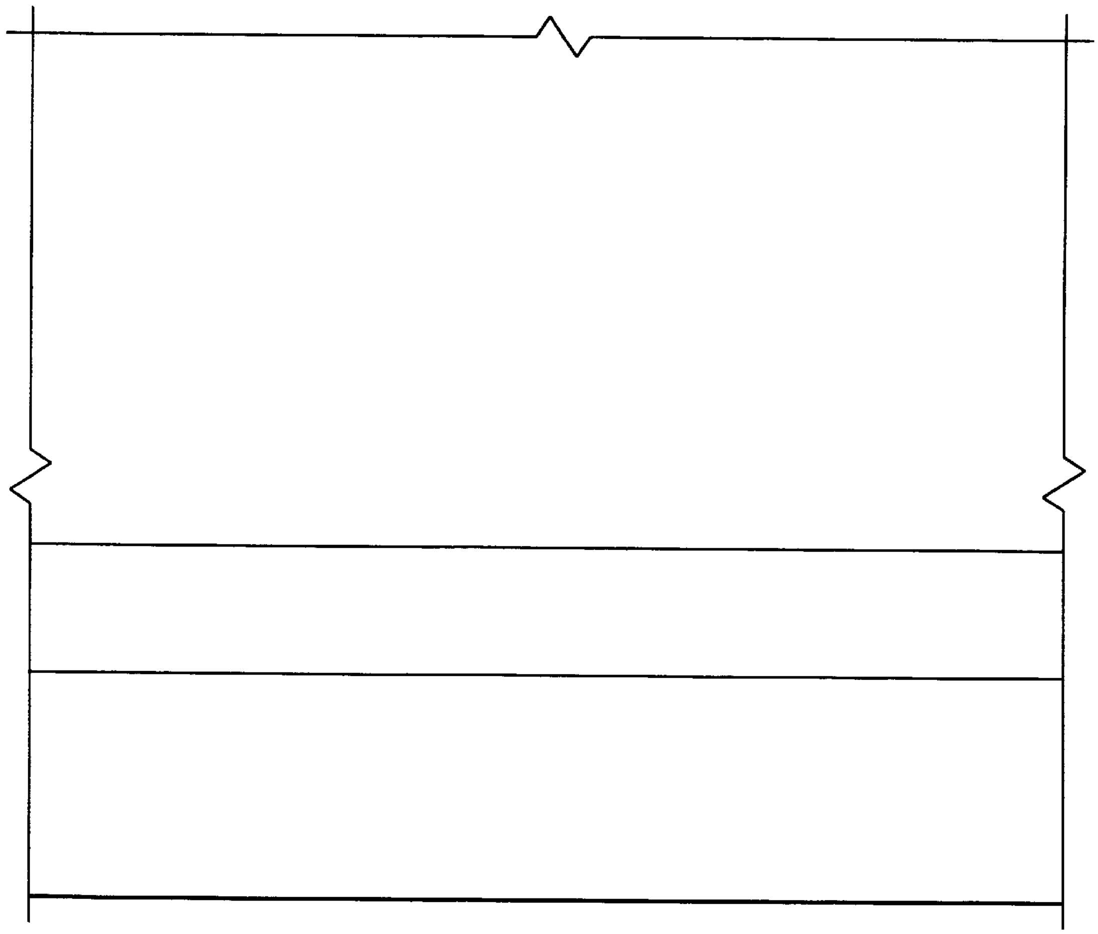
Fig 8.0107GK

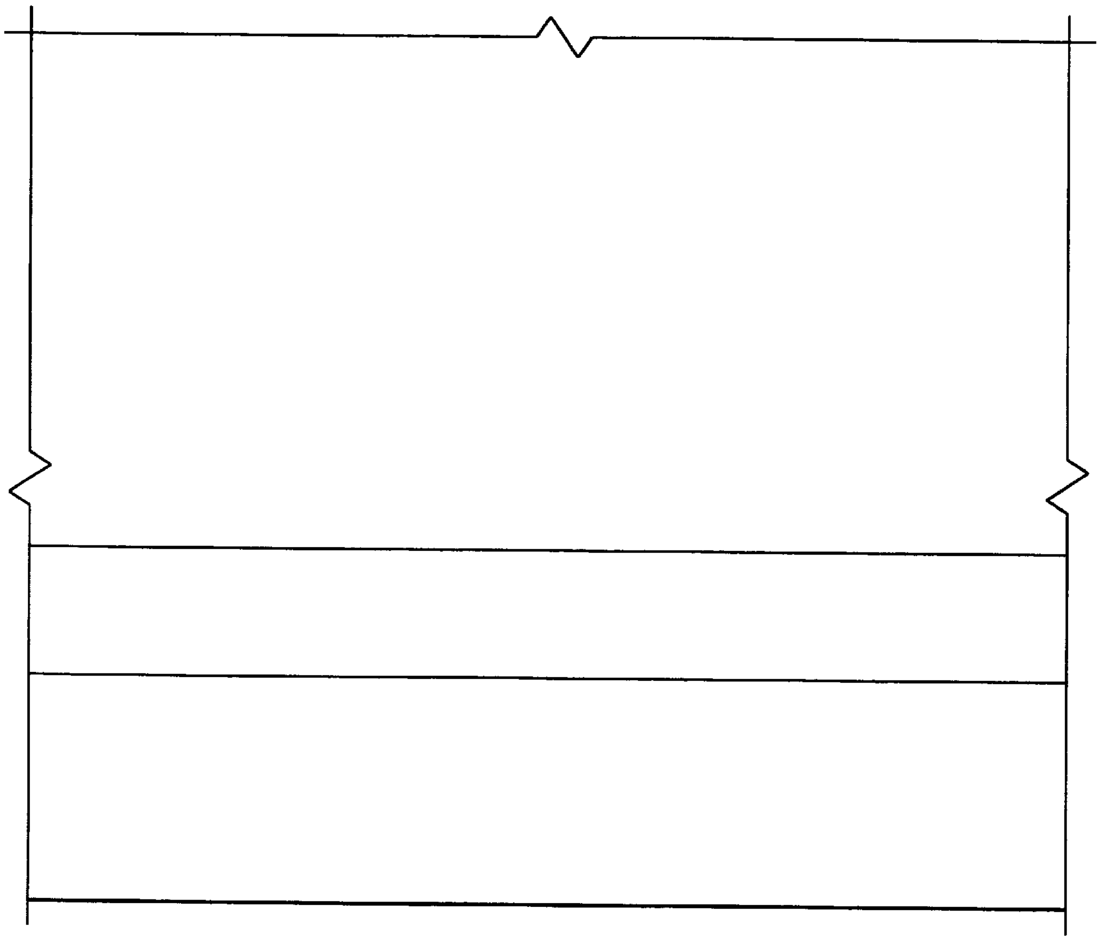
Fig. 8.0107GL

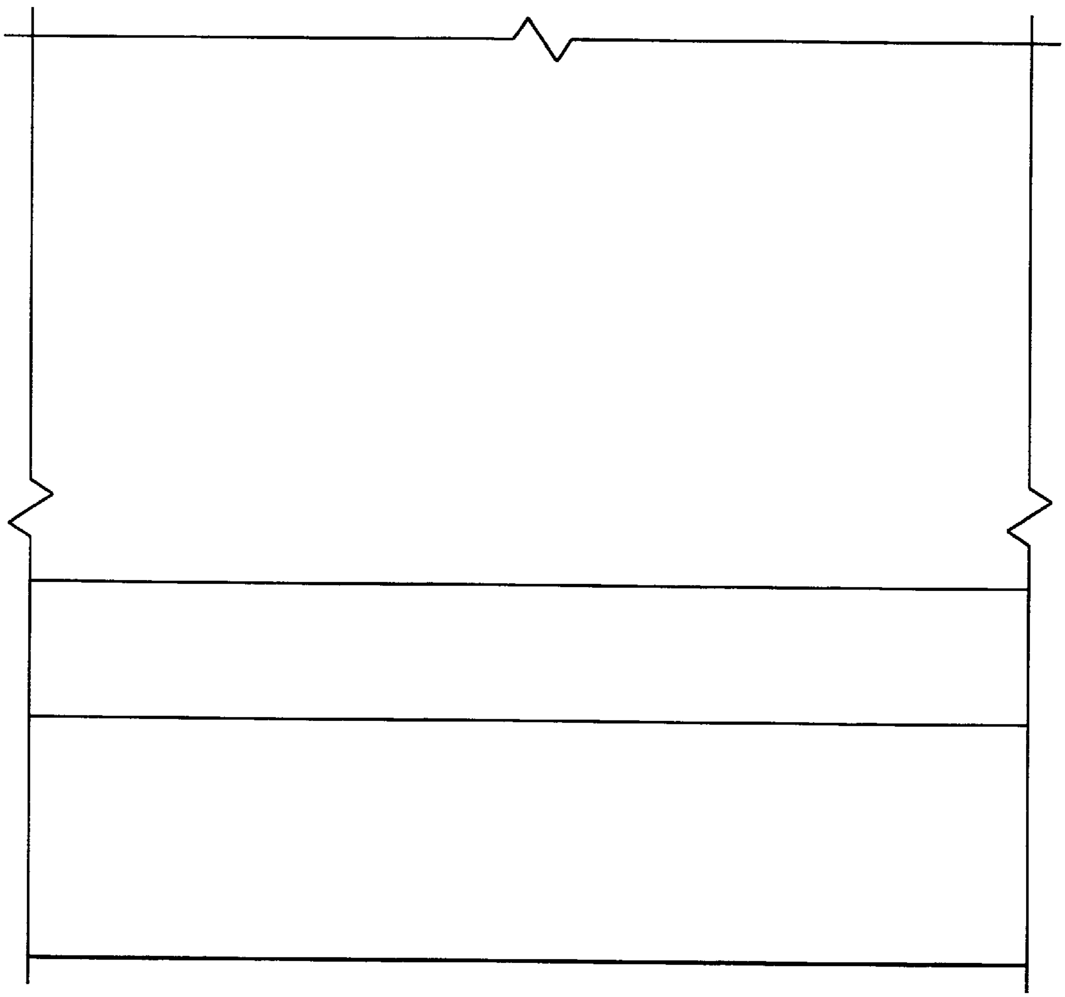
Fig 8.0107GM

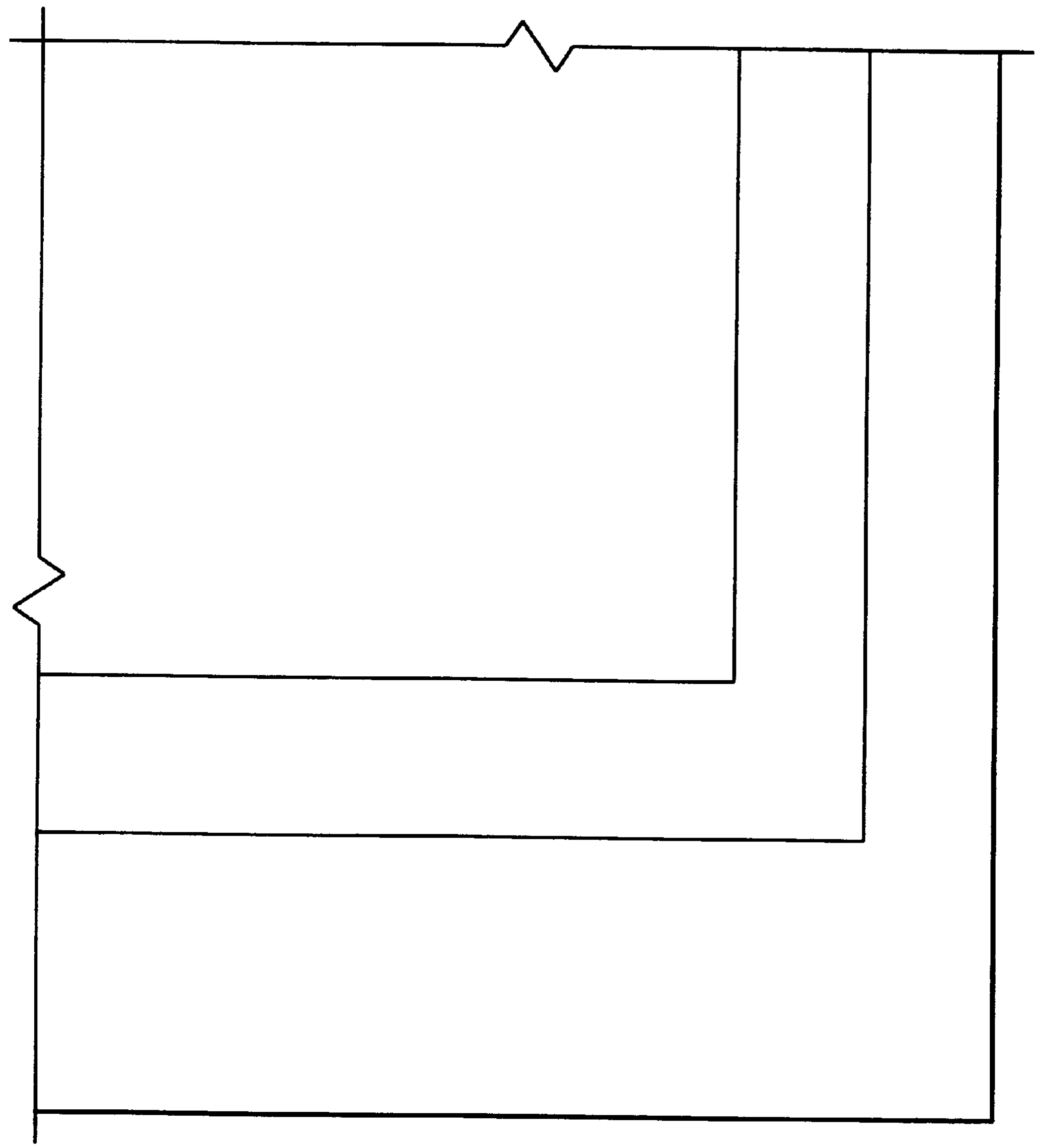
Fig 8.0107GN

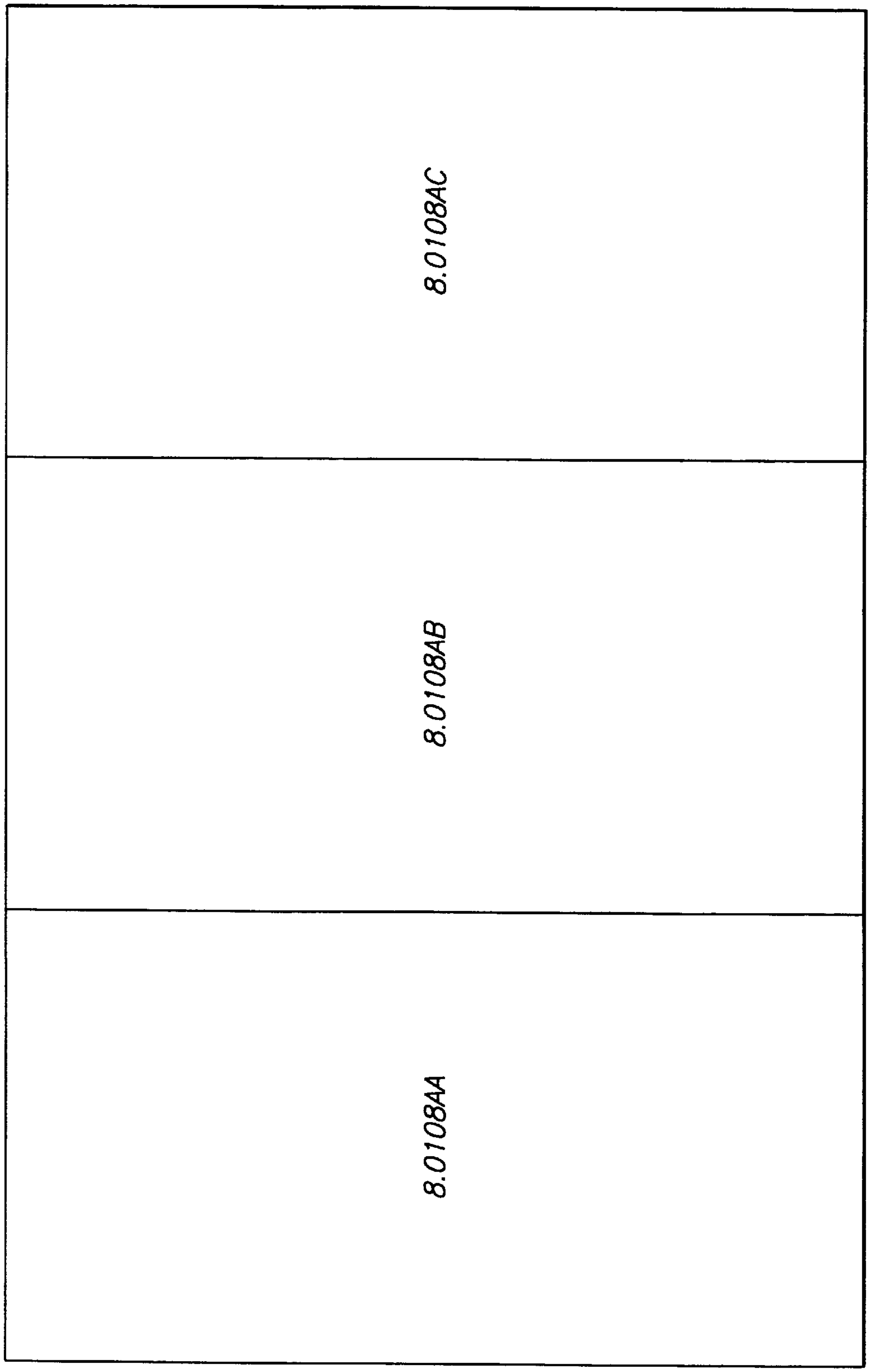
Fig. 8.0108

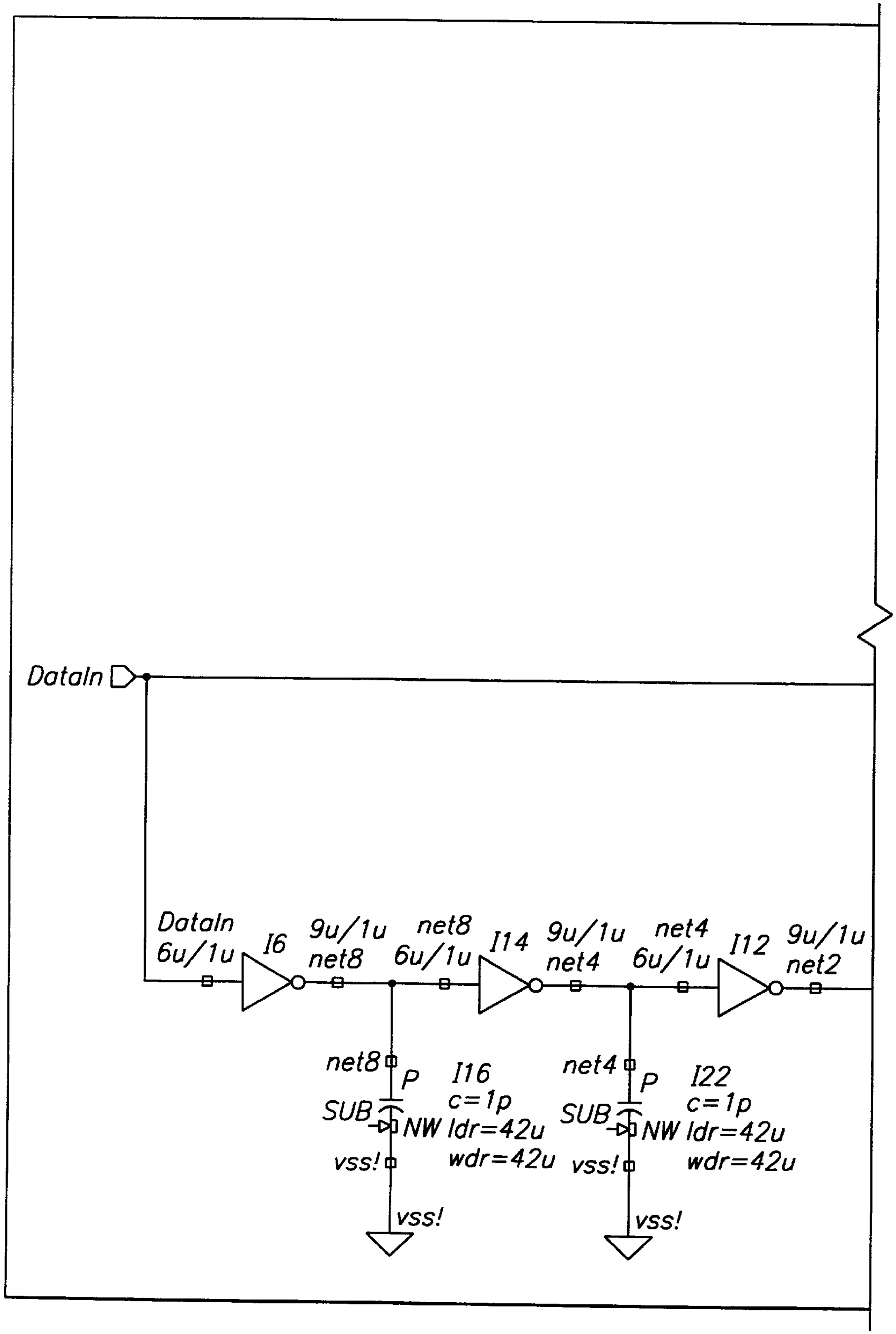
Fig 8.0108AA

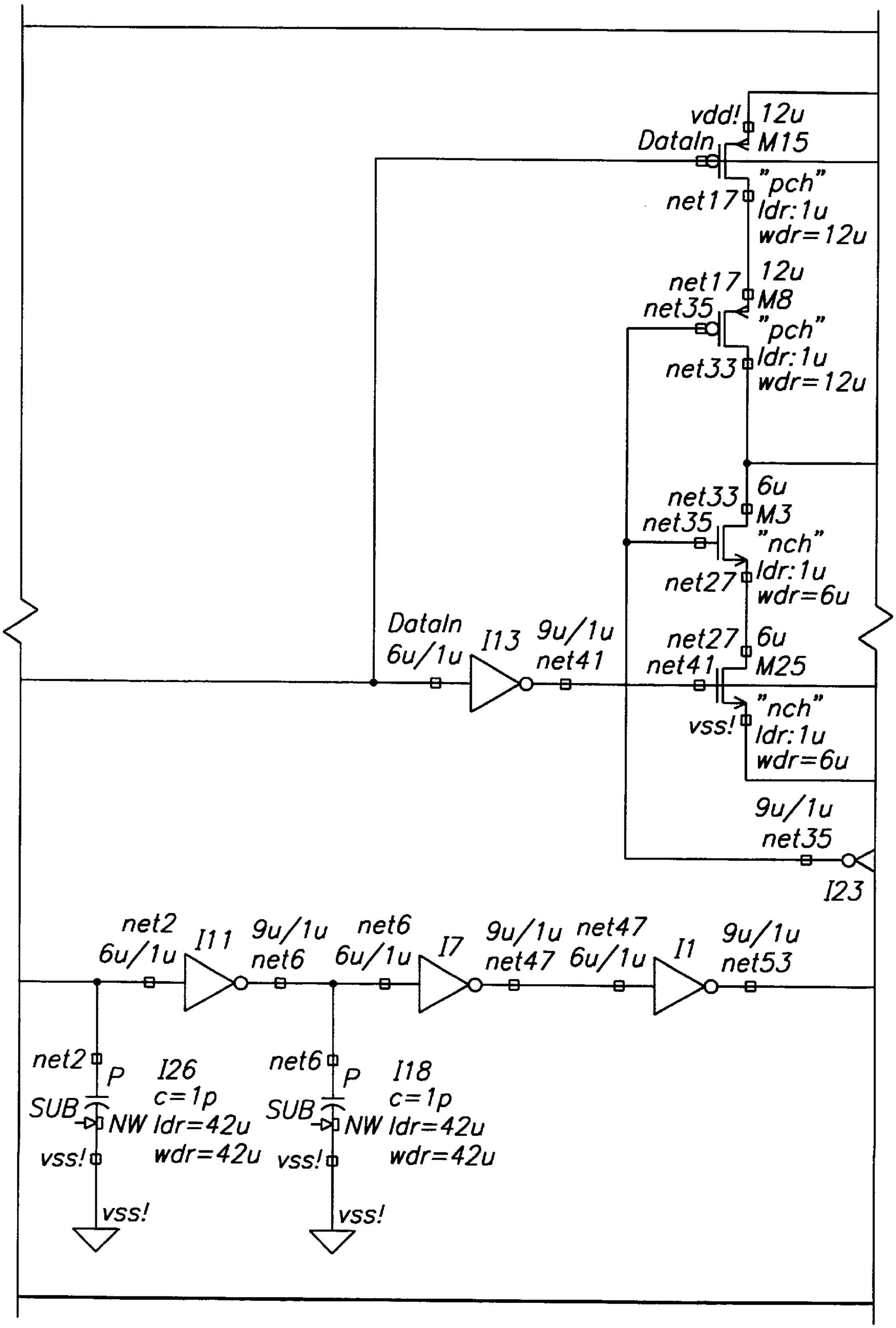
Fig 8.108AB

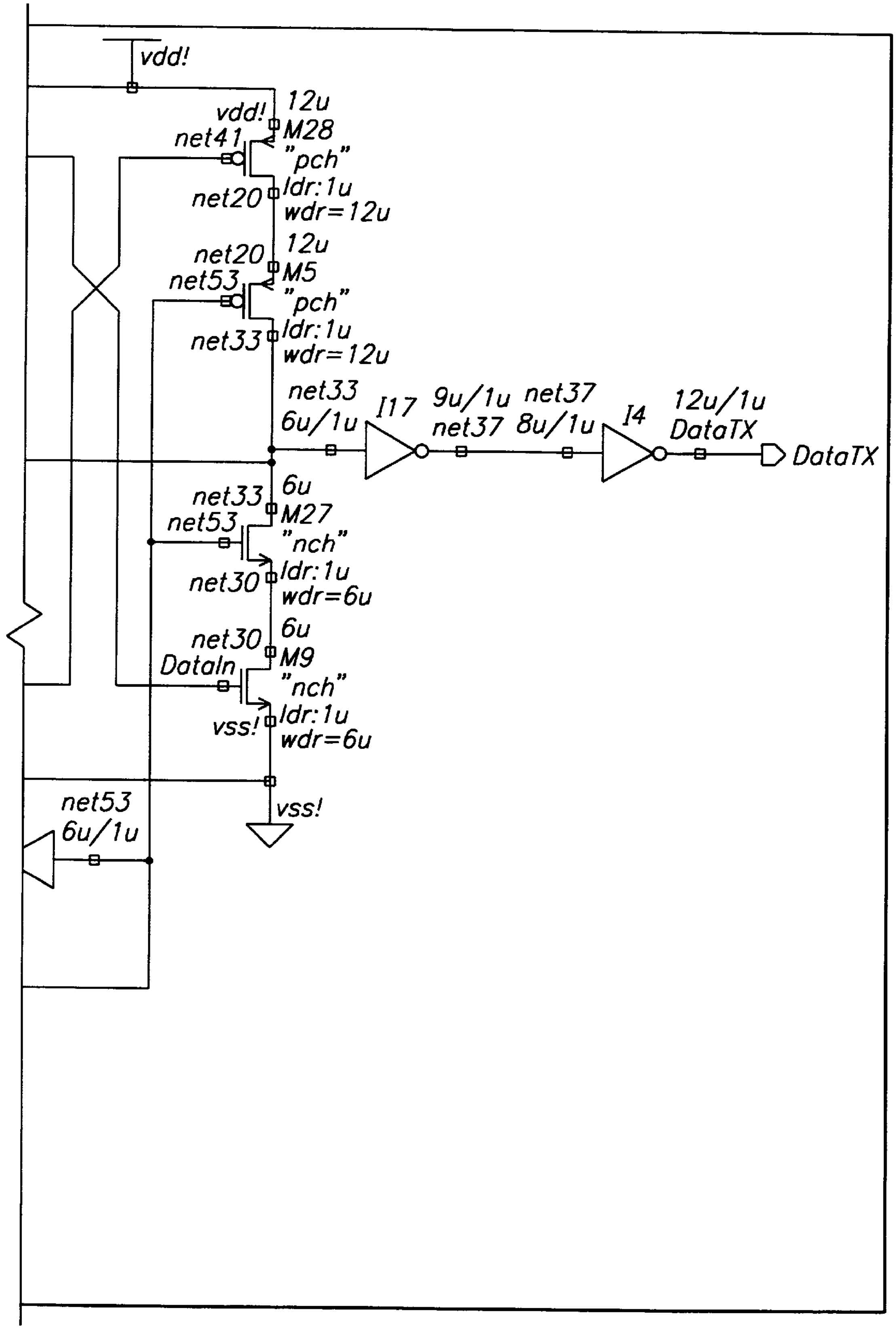
Fig 8.0108AC

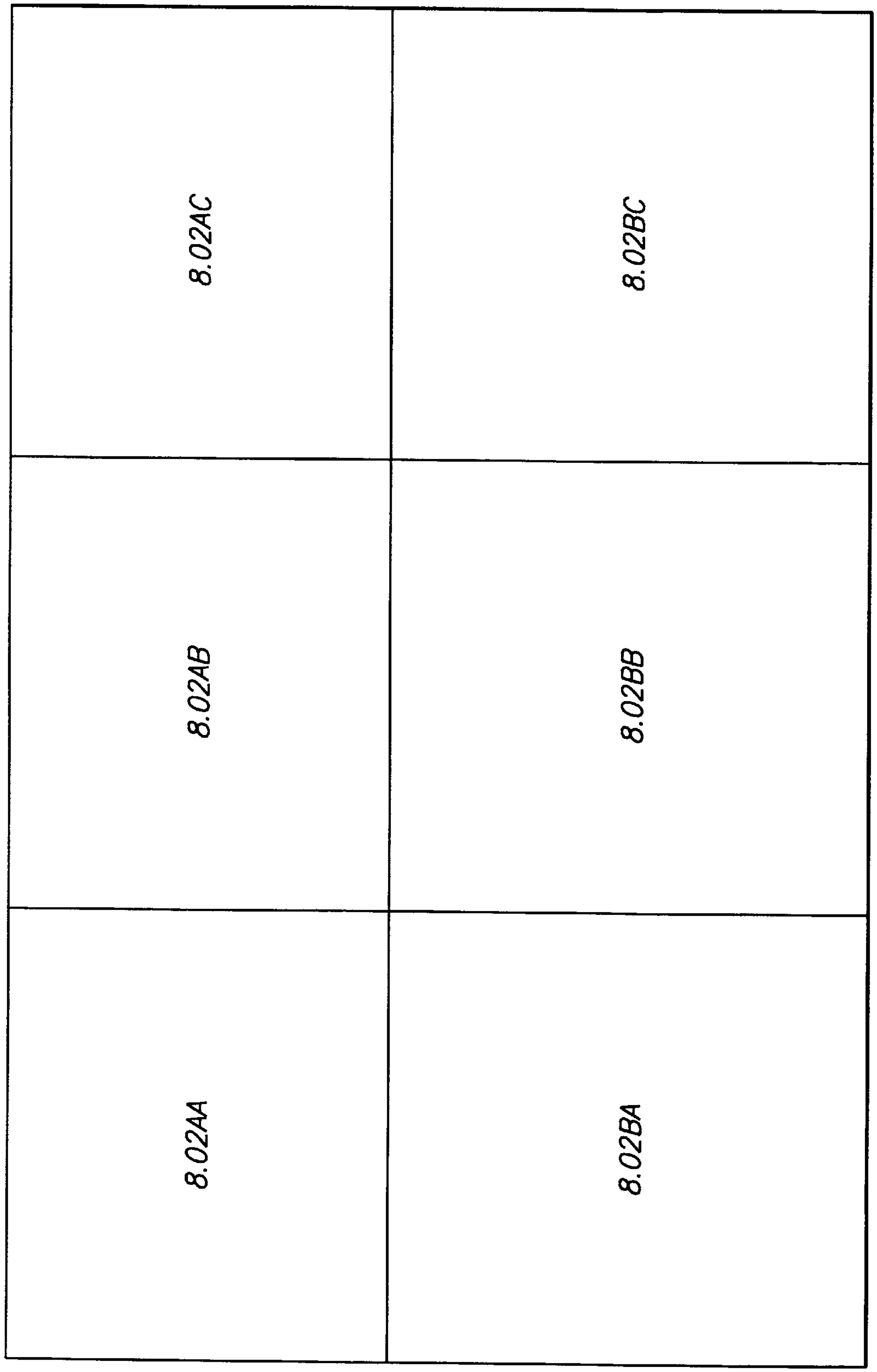
Fig. 8.02

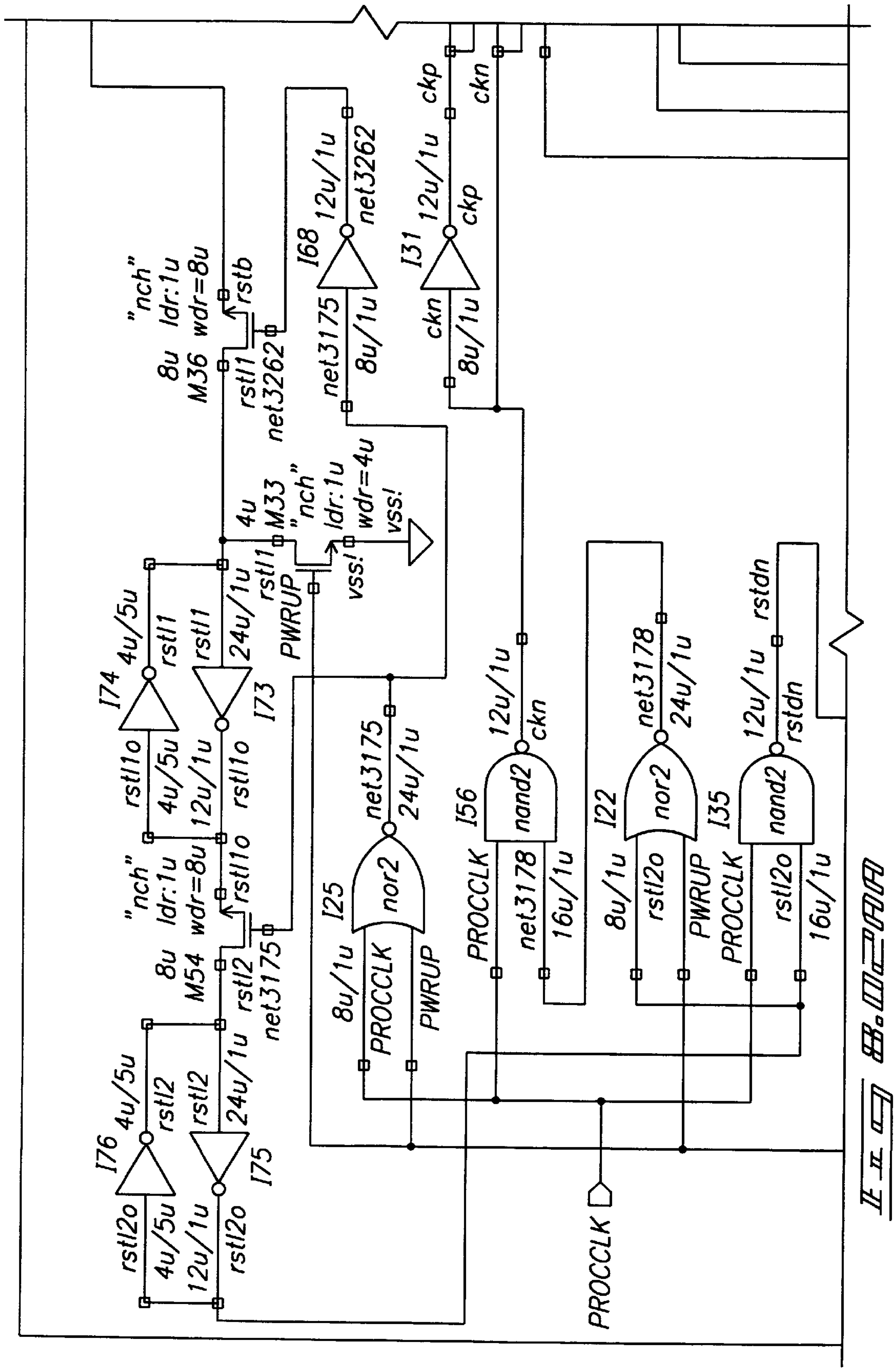
"nch"
ldr:1u
wdr=8u
8u
M36
rstb
rstl1
net3262
I68
12u/1u
net3262
net3175
8u/1u
I31
12u/1u
ckp
ckn
8u/1u
4u
M33
"nch"
ldr:1u
wdr=4u
vss!
I74
4u/5u
rstl1
I73
24u/1u
rstl1o
12u/1u
PWRUP
I25
nor2
net3175
24u/1u
8u/1u
PROCCLK
PWRUP
I56
nand2
12u/1u
net3178
16u/1u
I22
nor2
24u/1u
rstl2o
I35
nand2
rstdn
M54
rstl2
net3175
I76
I75
rstl2o
12u/1u
4u/5u
PROCCLK

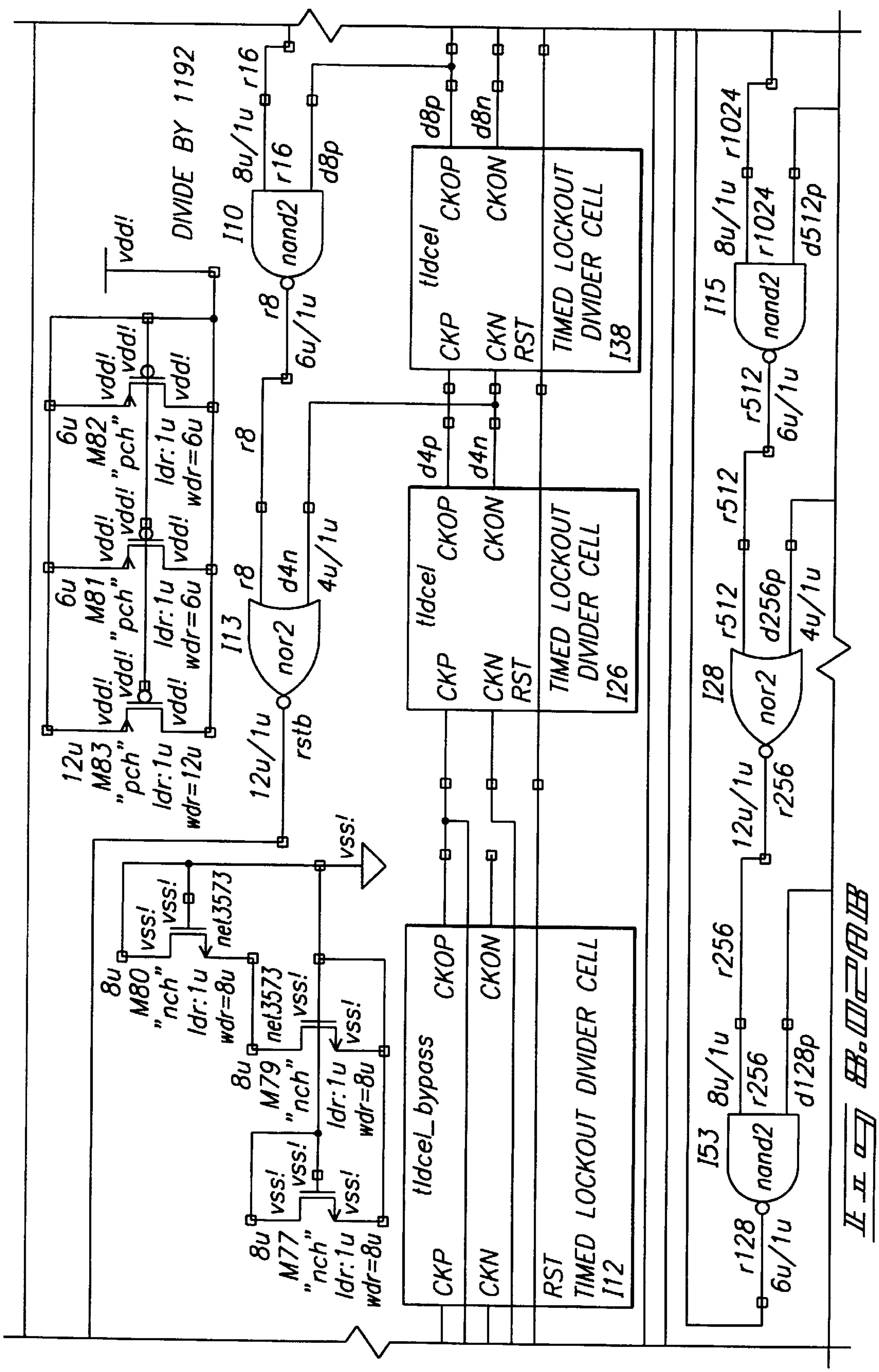
DIVIDE BY 1192
I10
nand2
I13
nor2
I15
I28
I53
tldcel
CKP
CKN
RST
CKOP
CKON
TIMED LOCKOUT DIVIDER CELL
I38
I26
tldcel_bypass
I12
M77
M79
M80
M81
M82
M83
"nch"
"pch"
vdd!
vss!
net3573
rstb
r8
r16
r128
r256
r512
r1024
d4p
d4n
d8p
d8n
d128p
d256p
d512p

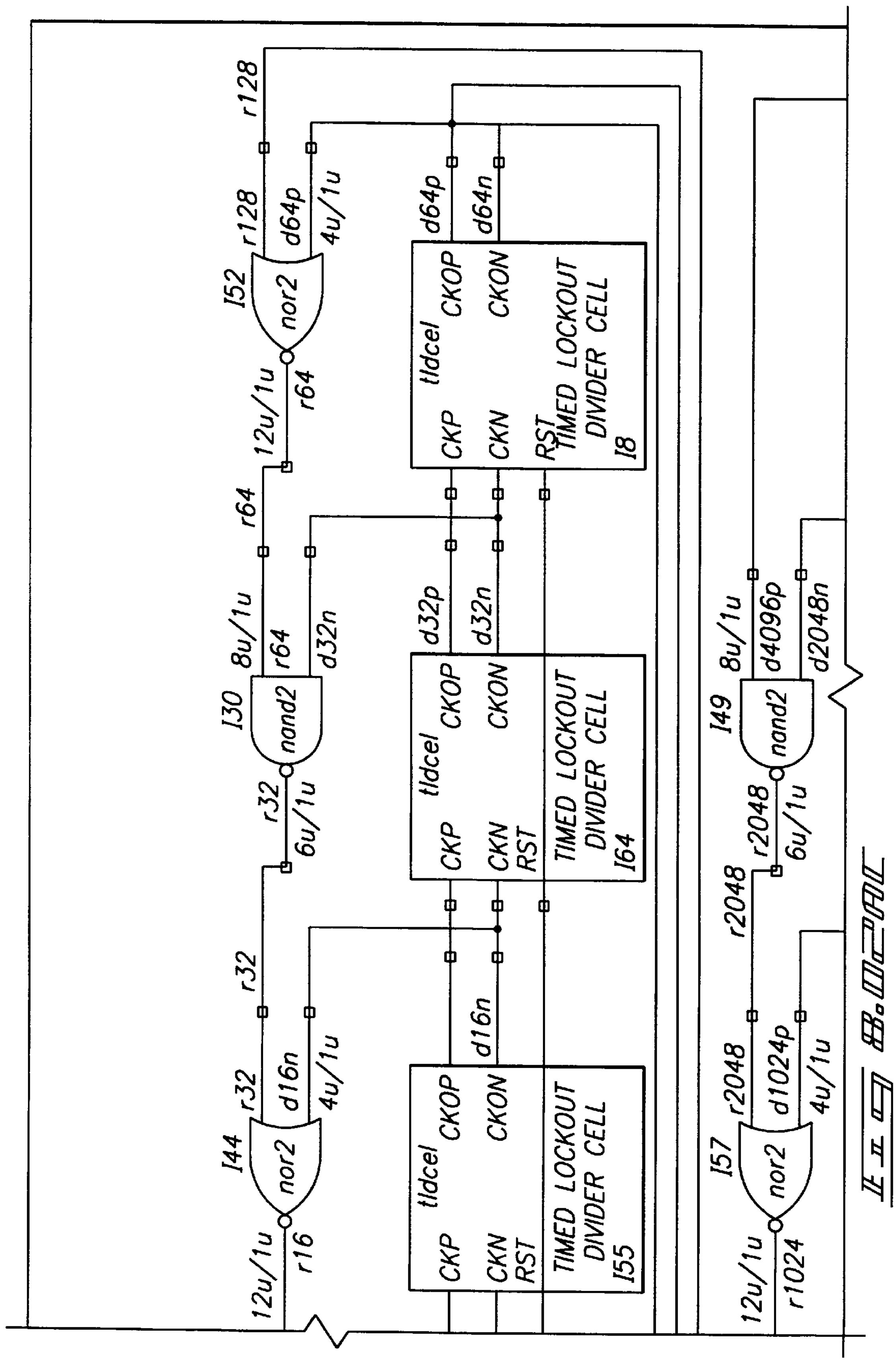
FIG. 8.02AC

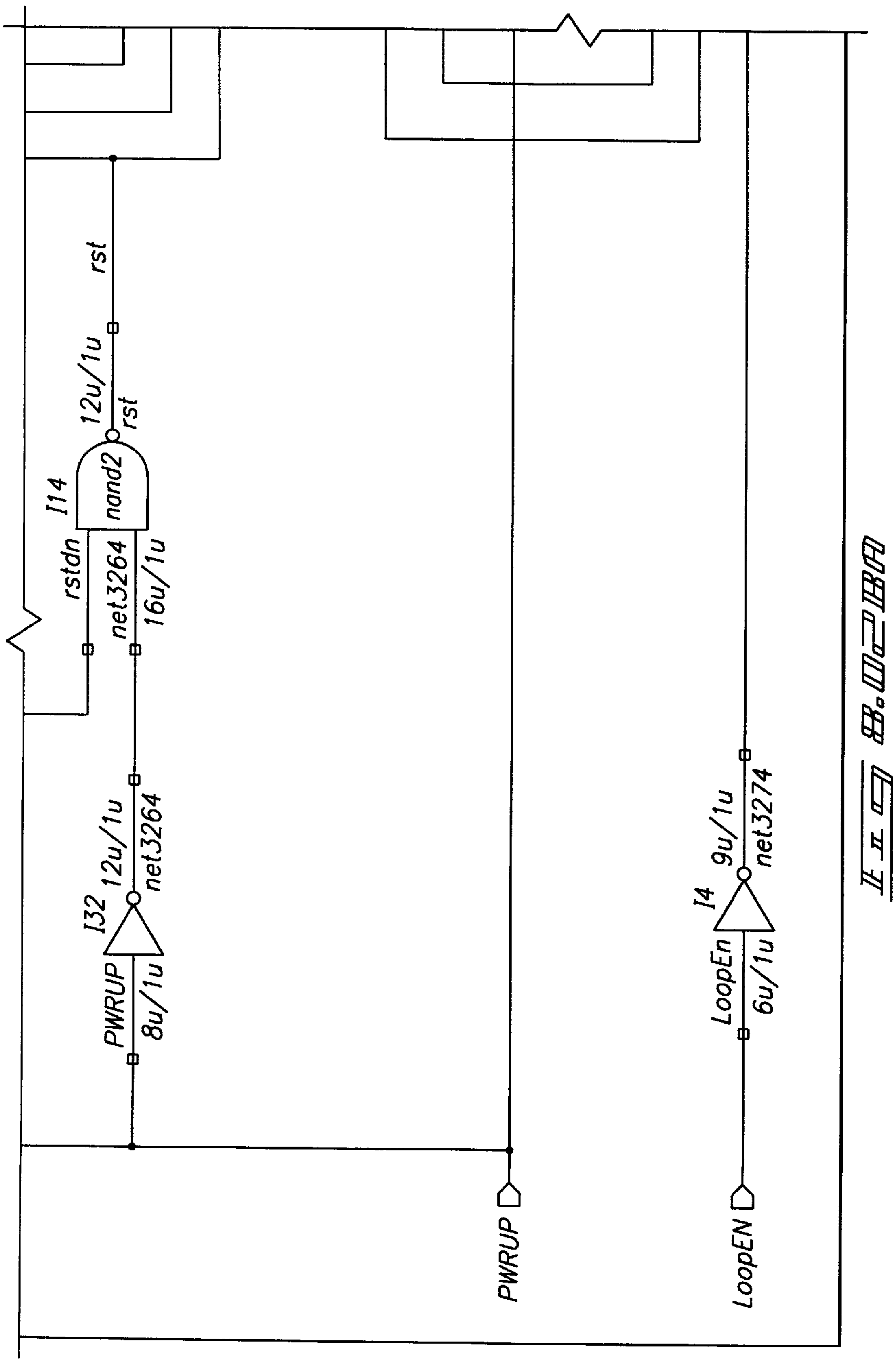
Fig. 8.02BA

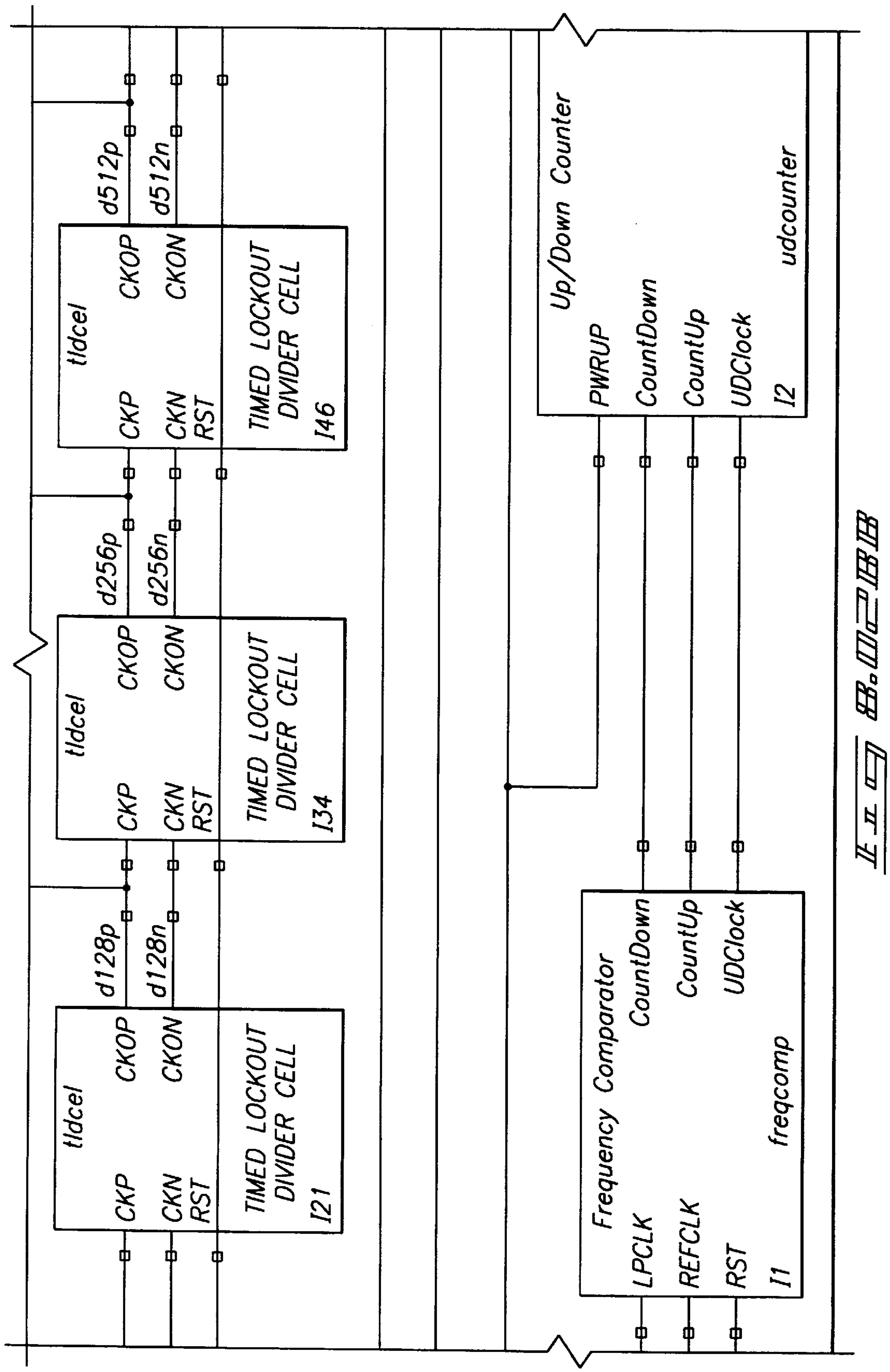
Fig. 8.02B

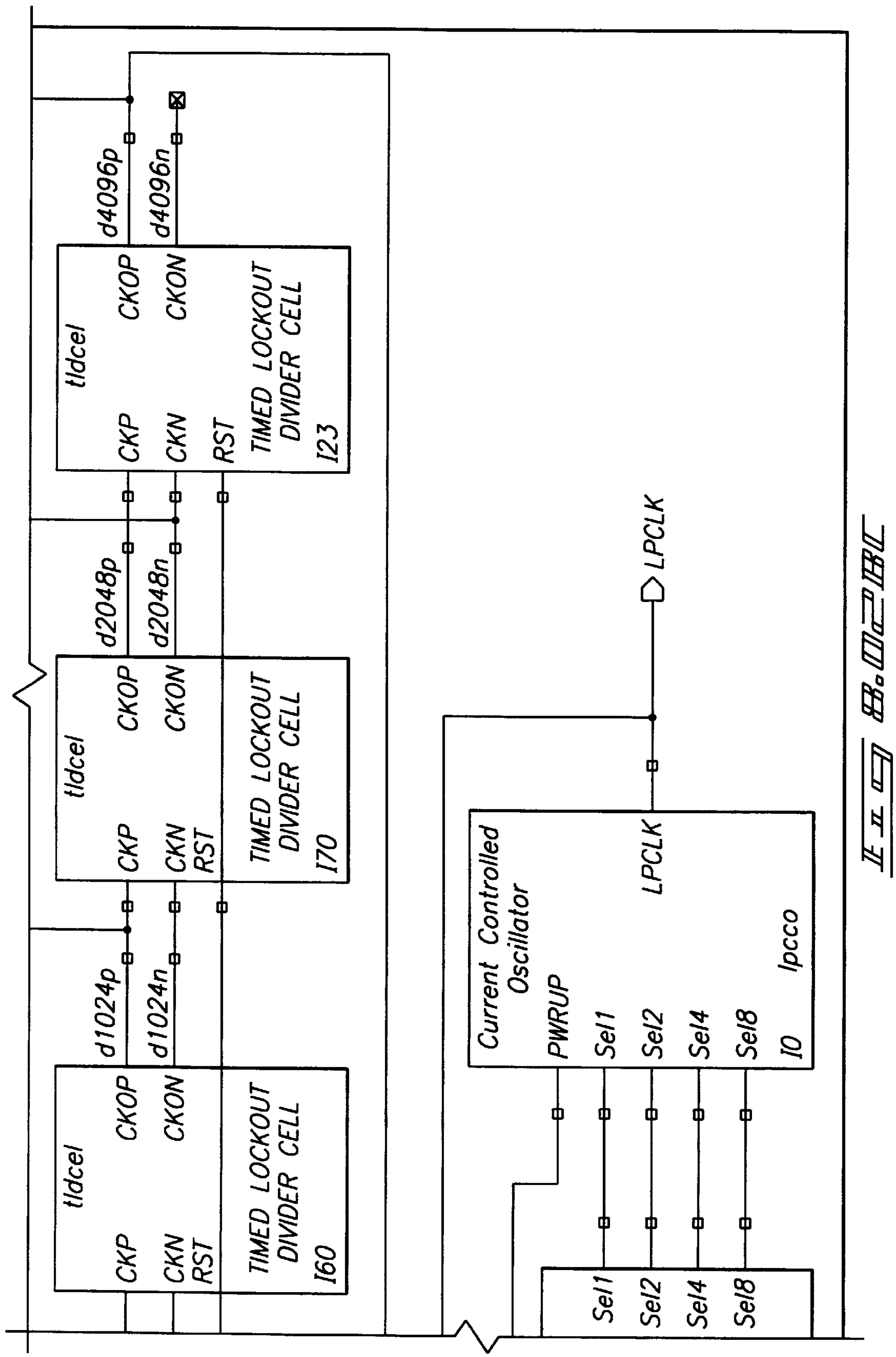
Fig. 8.02BC

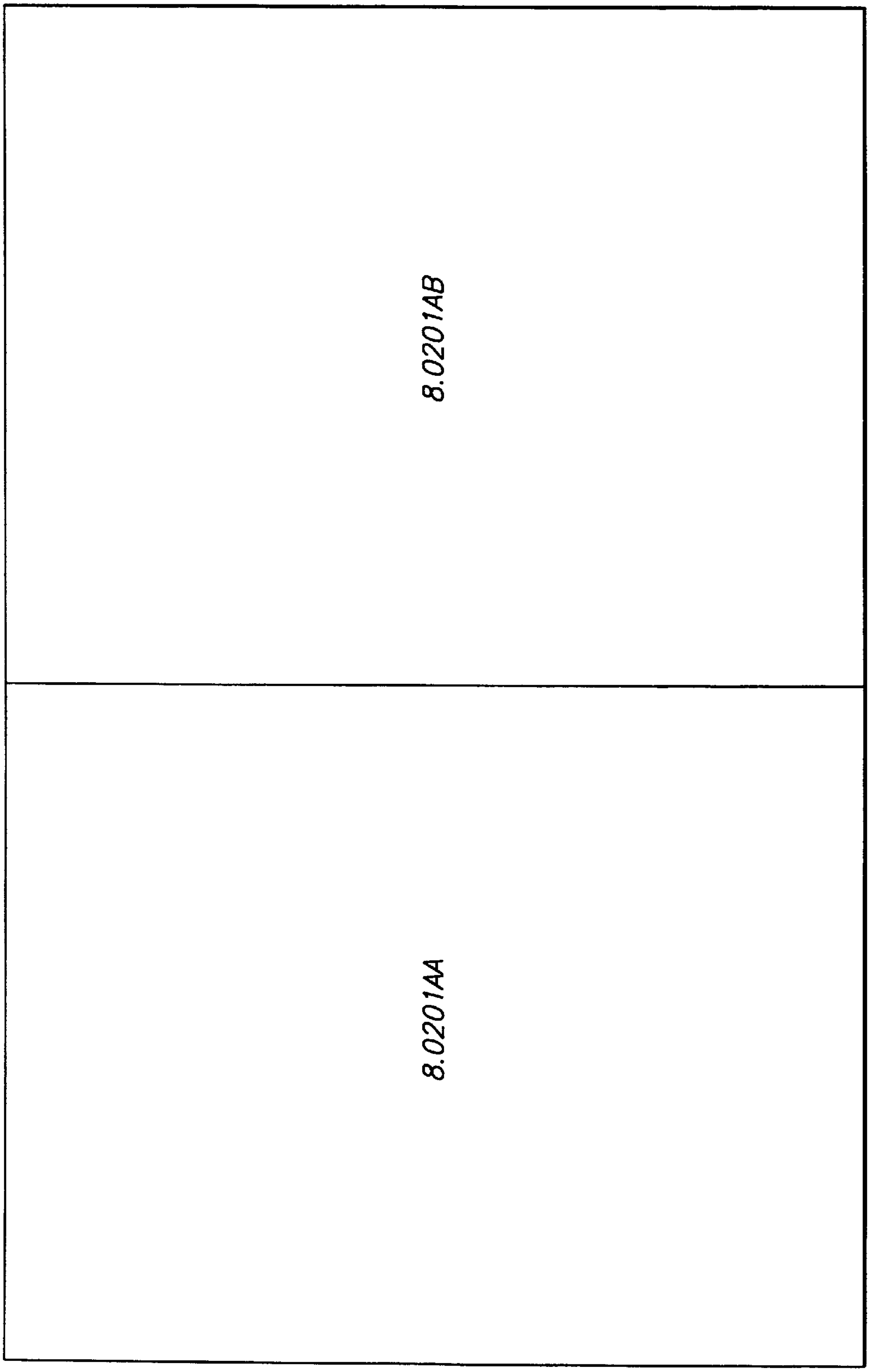
FIG. 8.0201

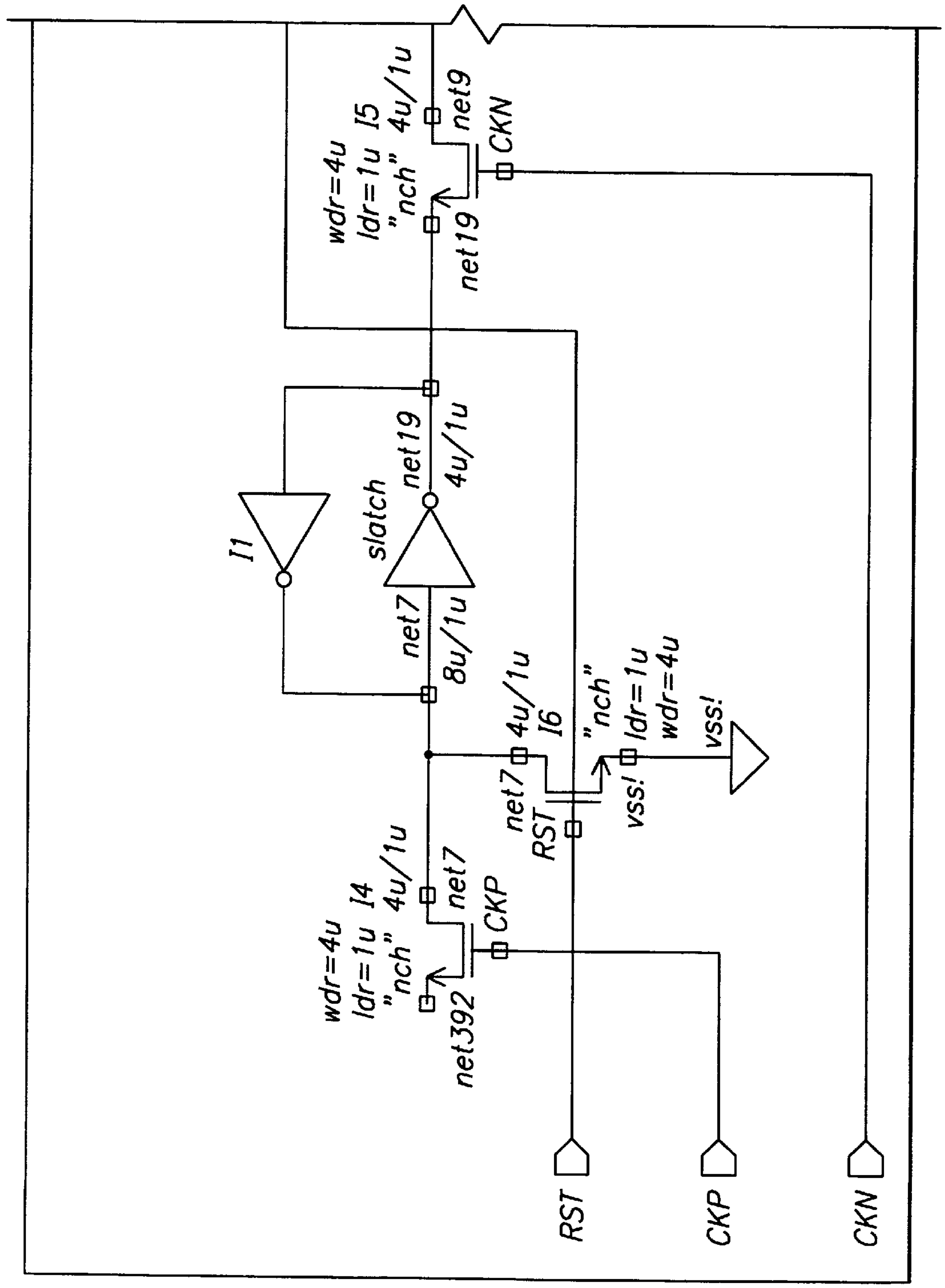
Fig. 8.0201AA

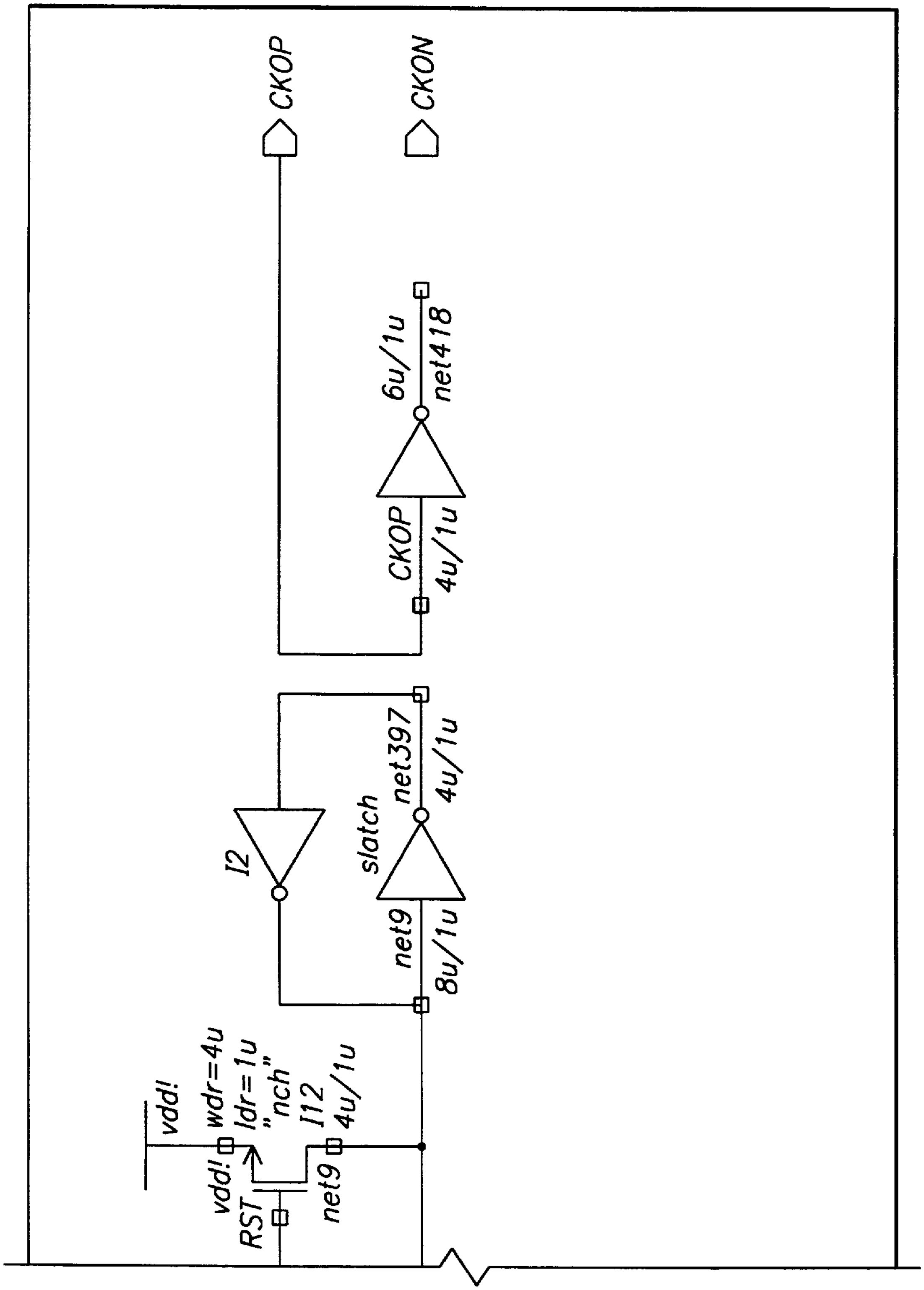
Fig. 8.0201AB

| | | | |
|---|---|---|---|
| 8.0202AA | 8.0202AB | 8.0202AC | 8.0202AD |
| 8.0202BA | 8.0202BB | 8.0202BC | 8.0202BD |
| 8.0202CA | 8.0202CB | 8.0202CC | 8.0202CD |

Fig 8.0202

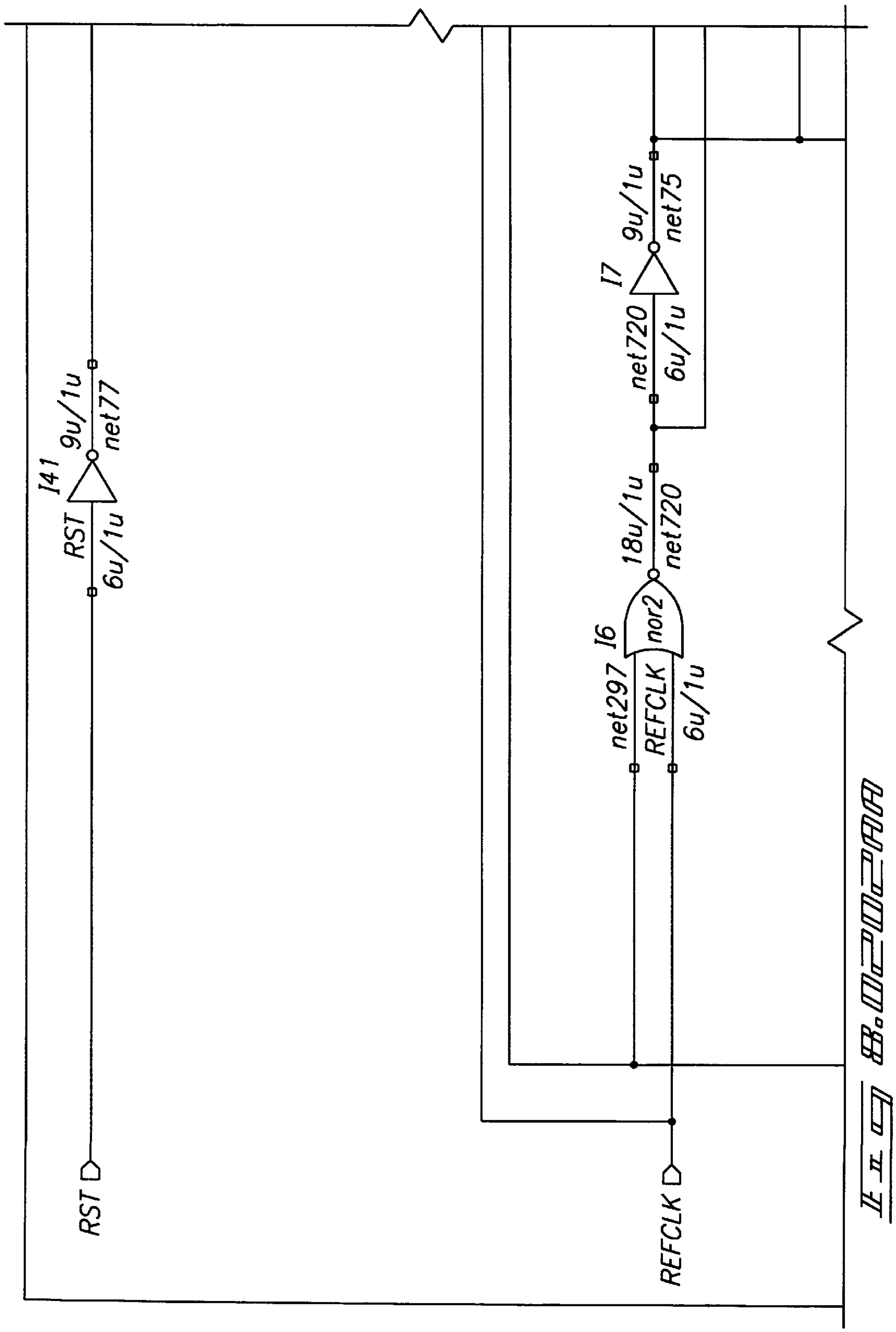
FIG. 8.00.02AA

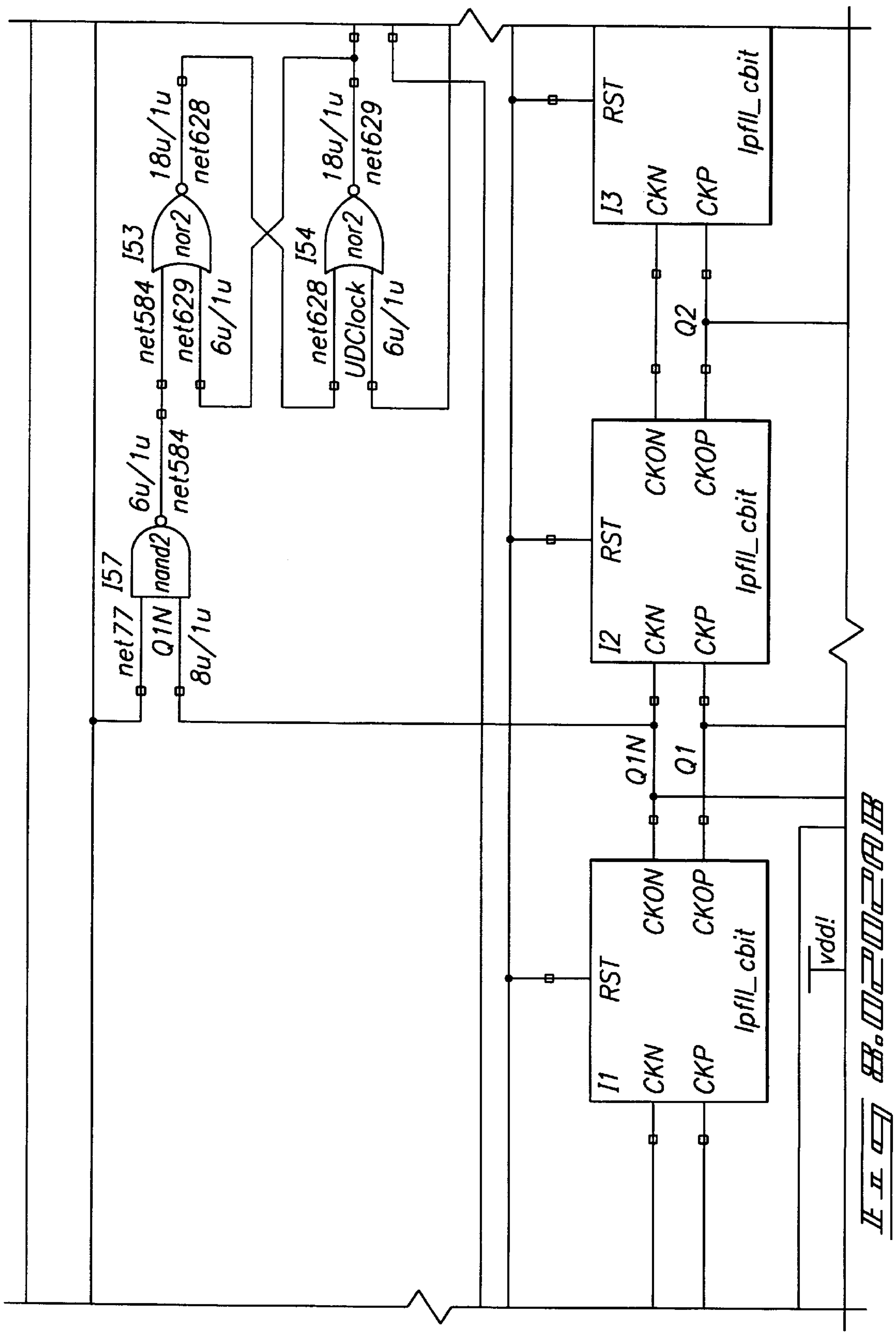
FIG. 8.0020AB

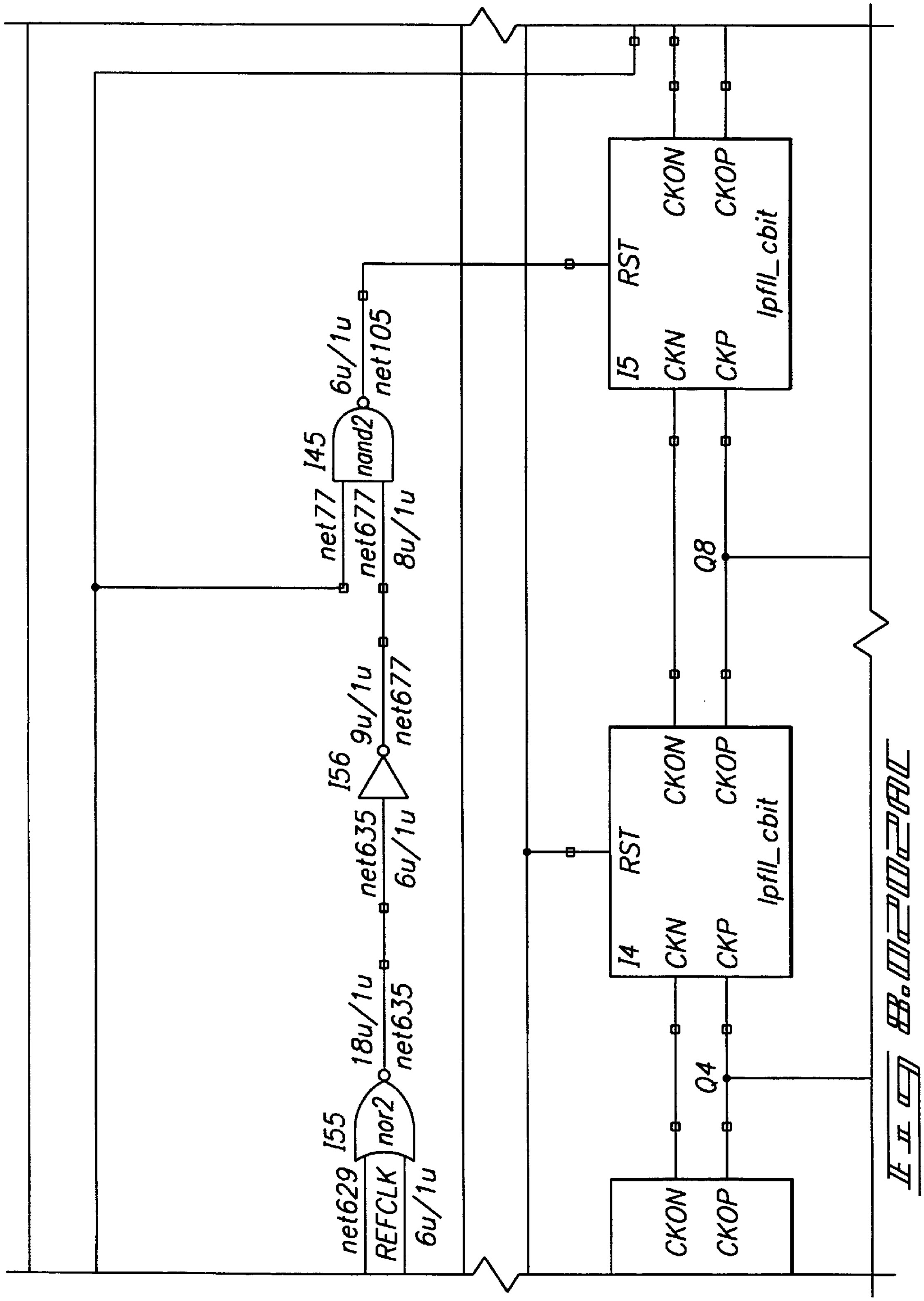
Fig. 8.0202AC

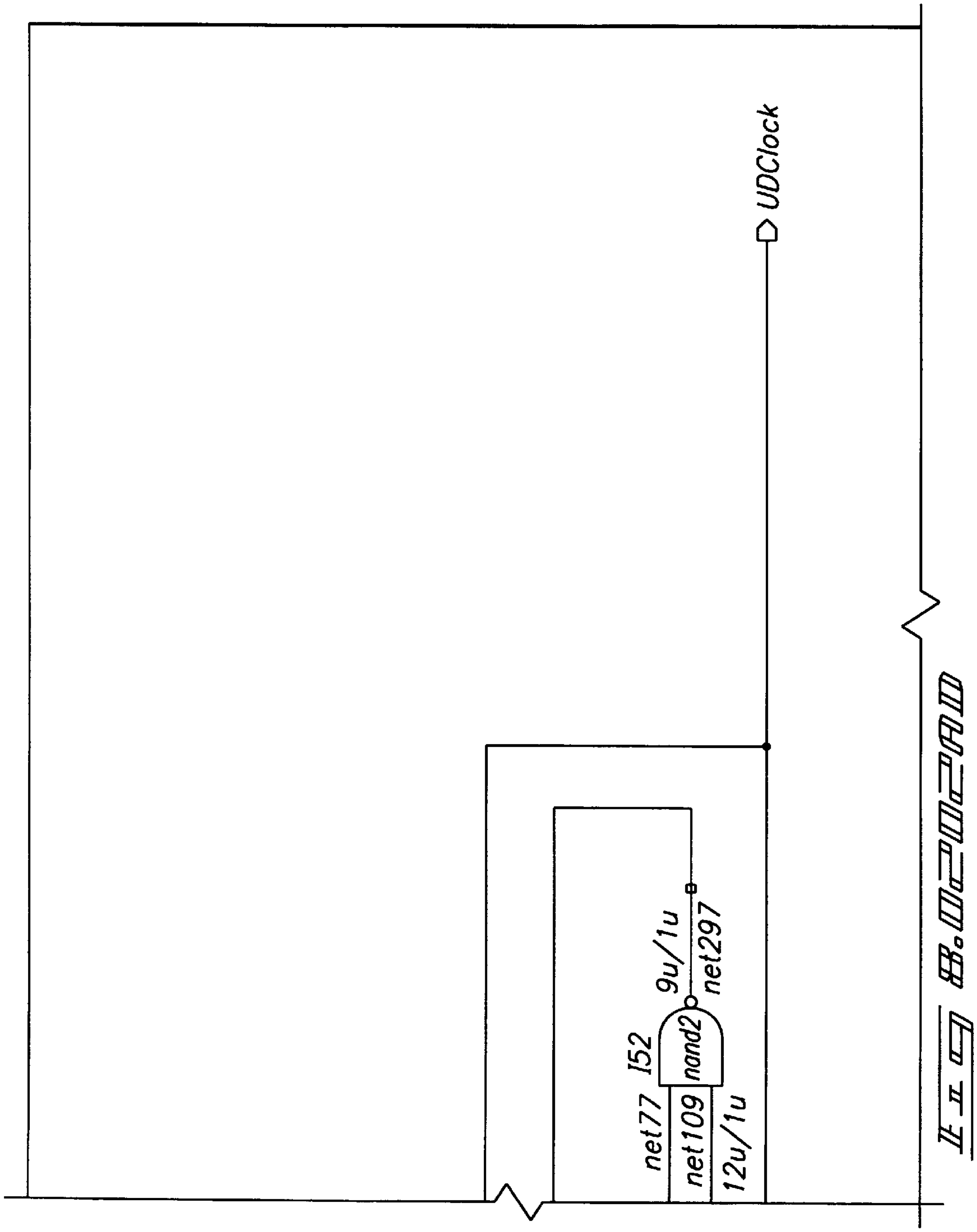
FIG. 8.0202AD

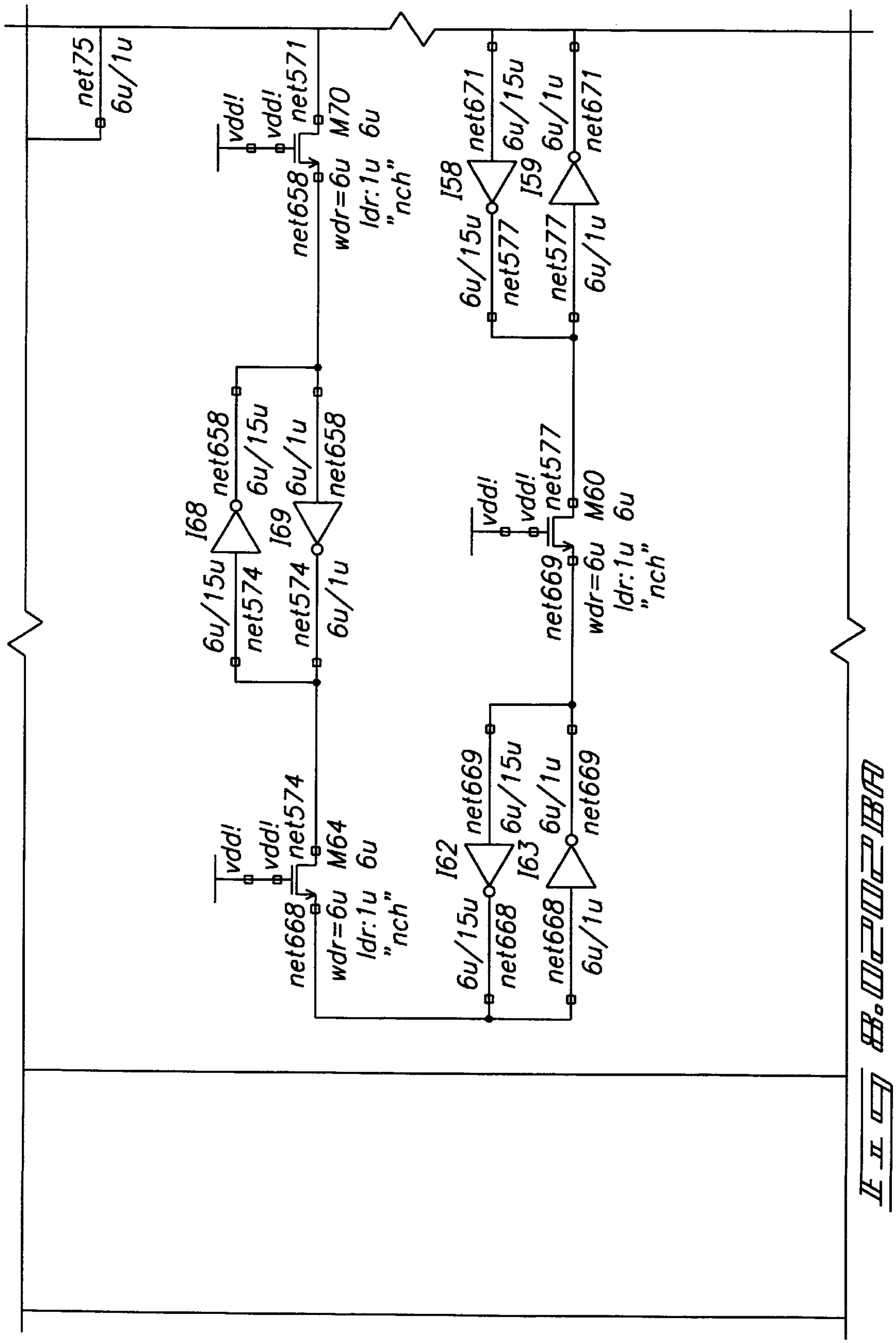
Fig 8.002BA

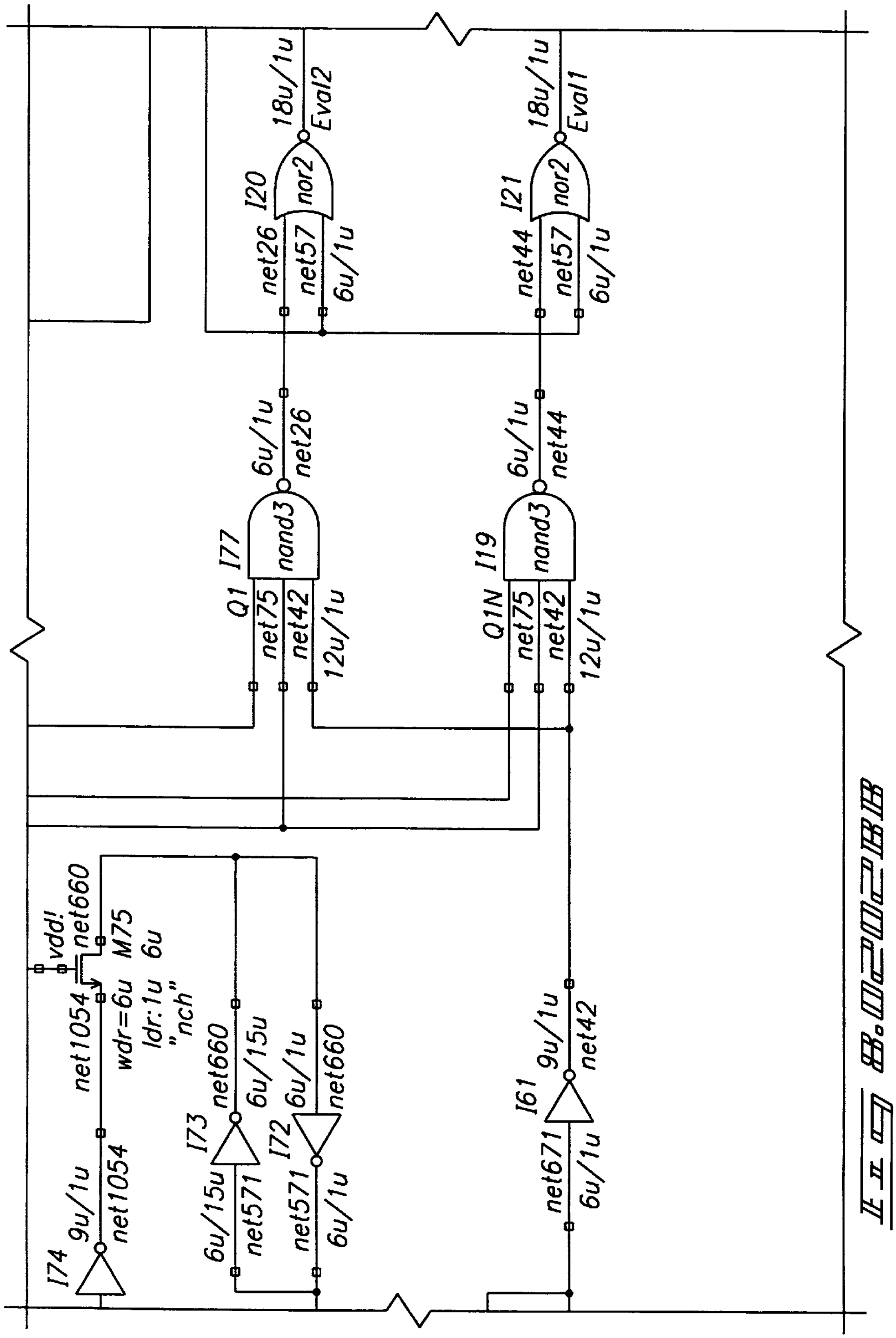
Fig. 8.002B

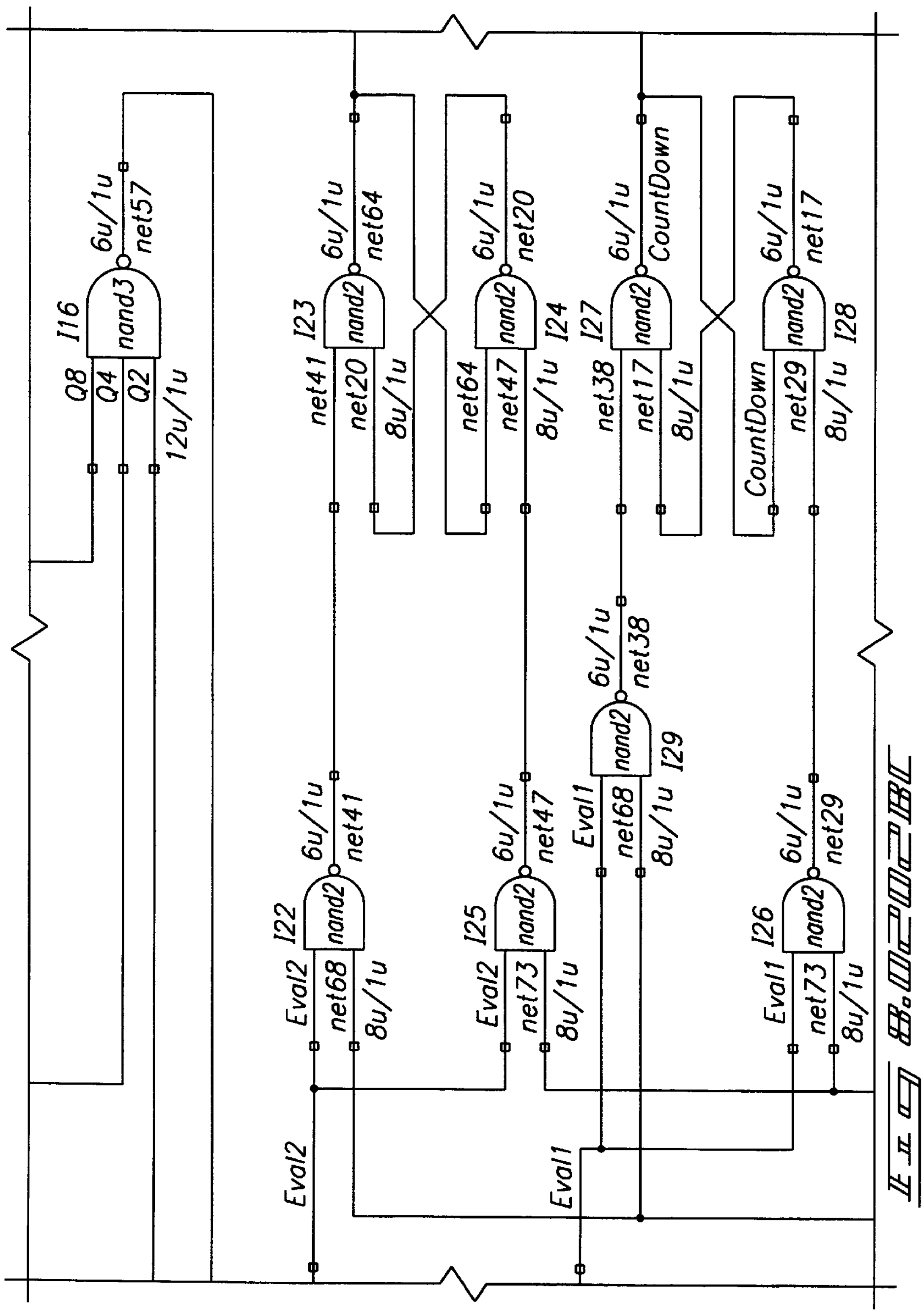
FIG. 8.002BC

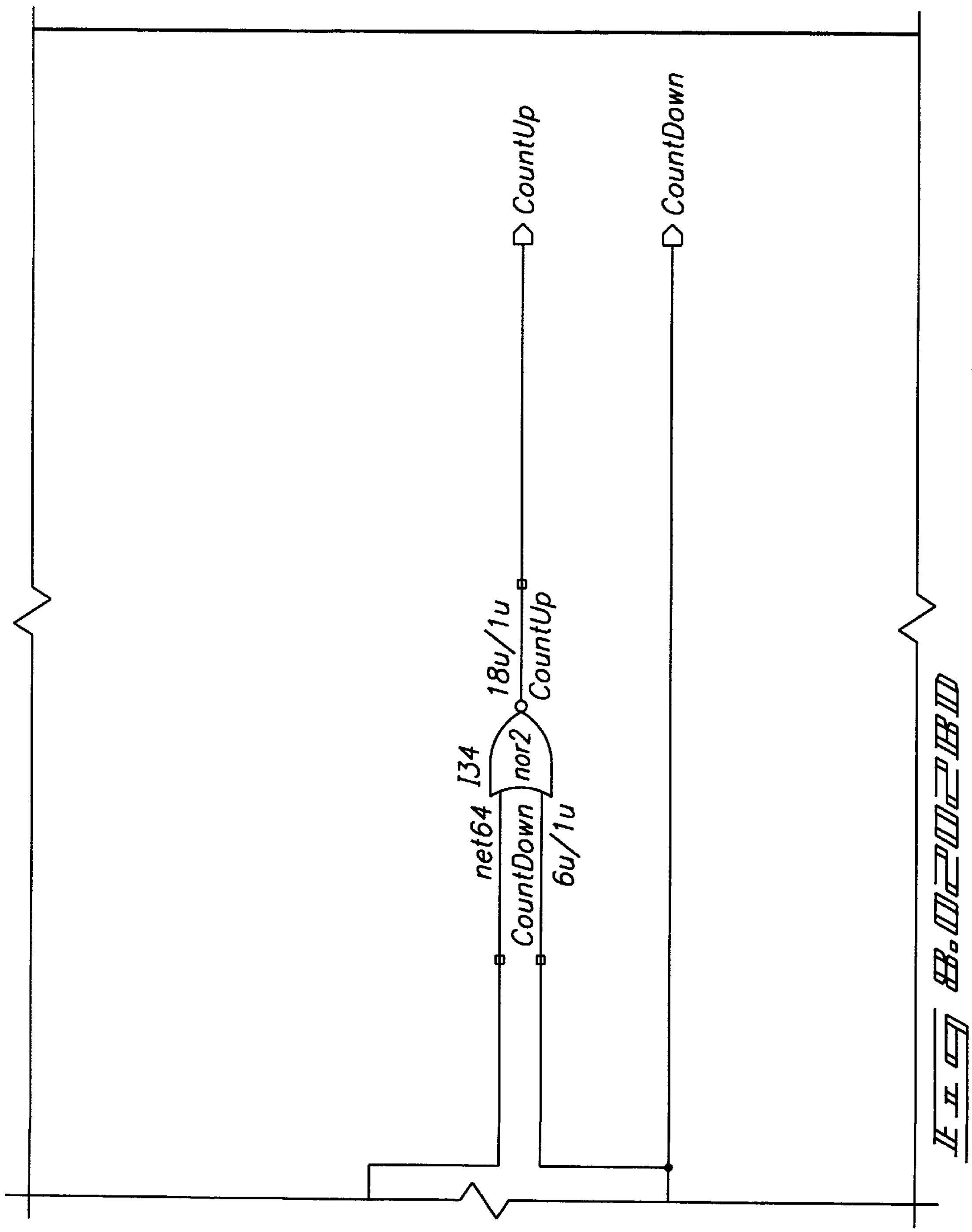
Fig. 8.0202BD

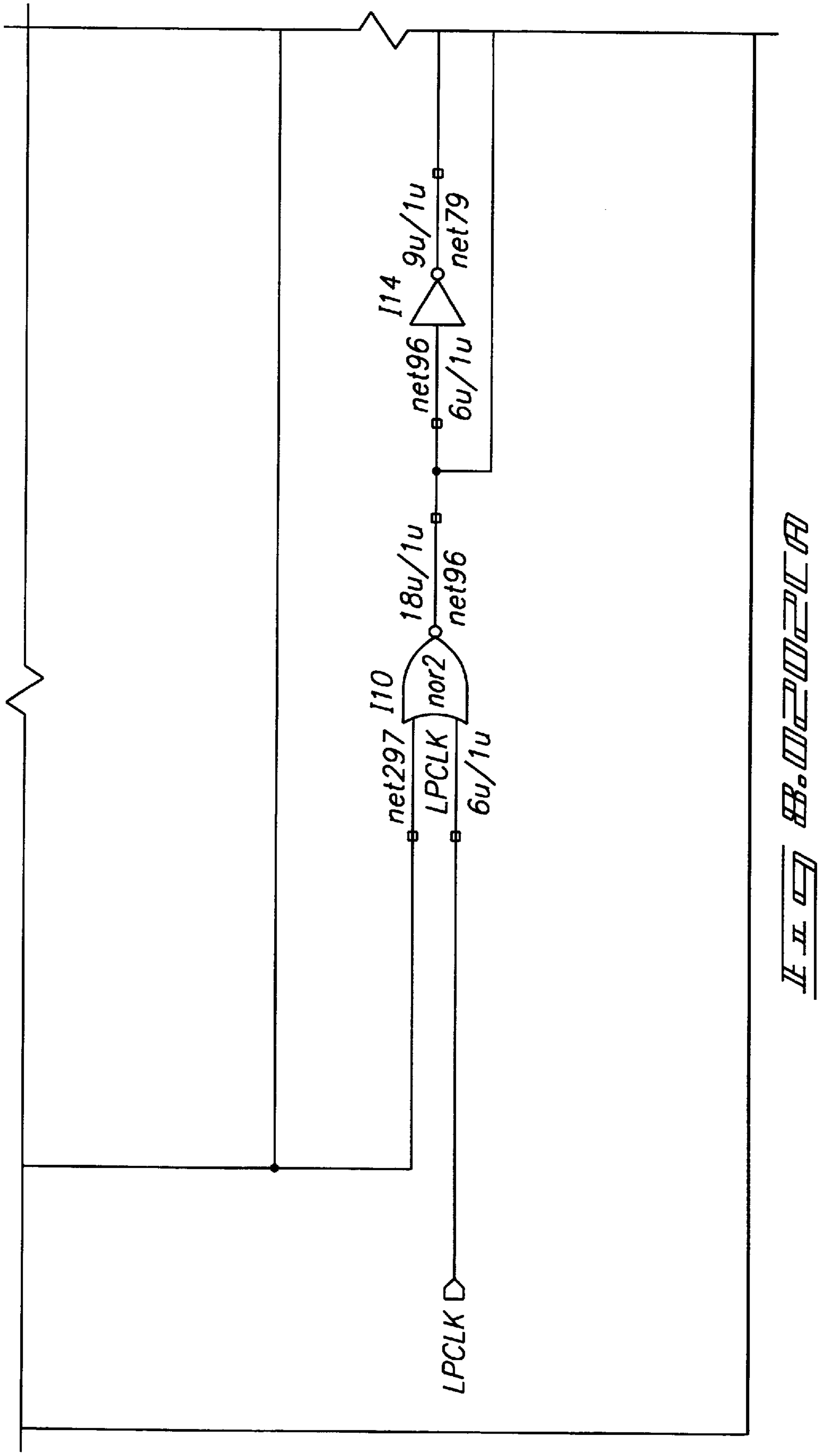
FIG 8.020CA

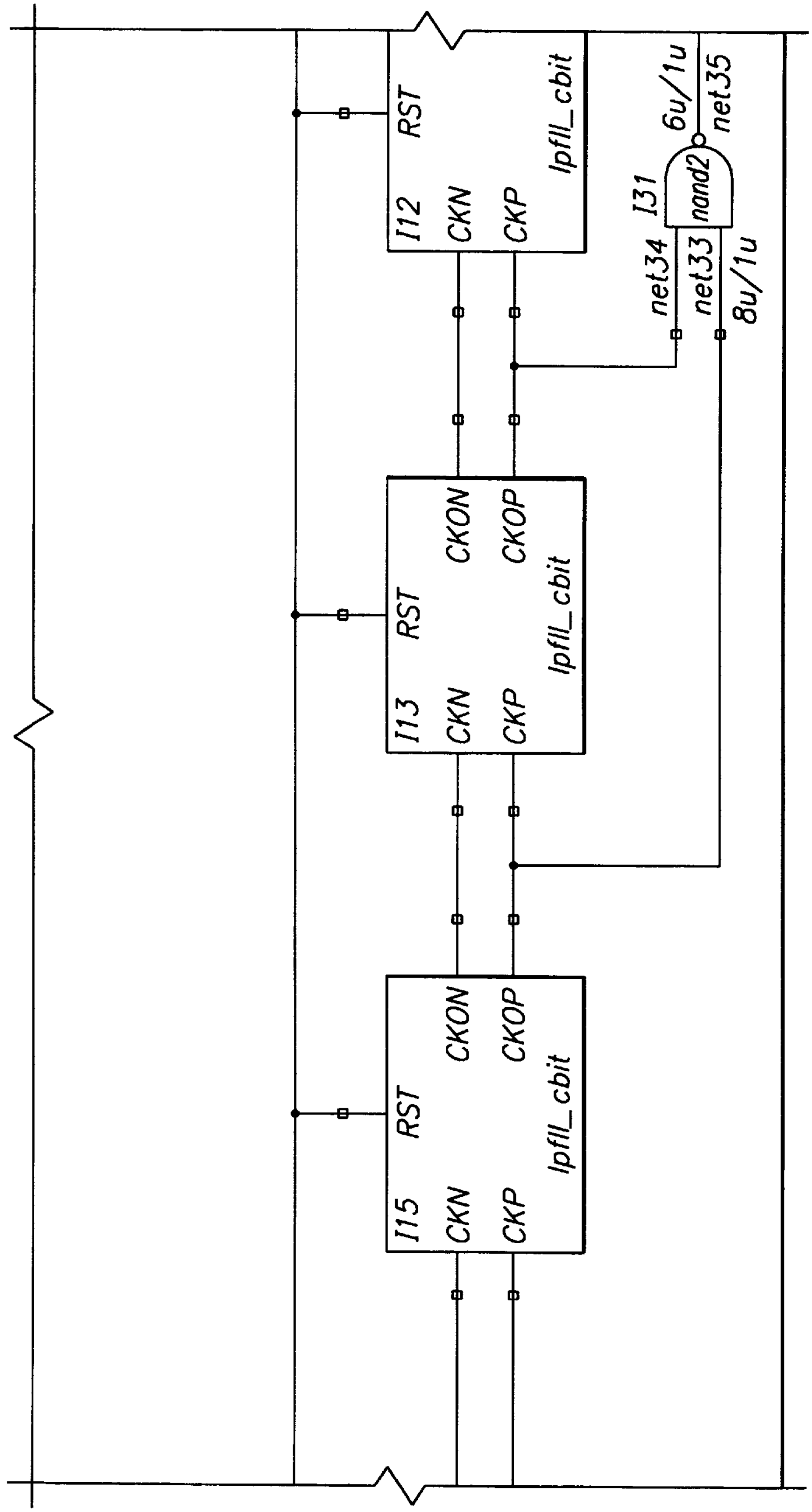
Fig. 8.0202CB

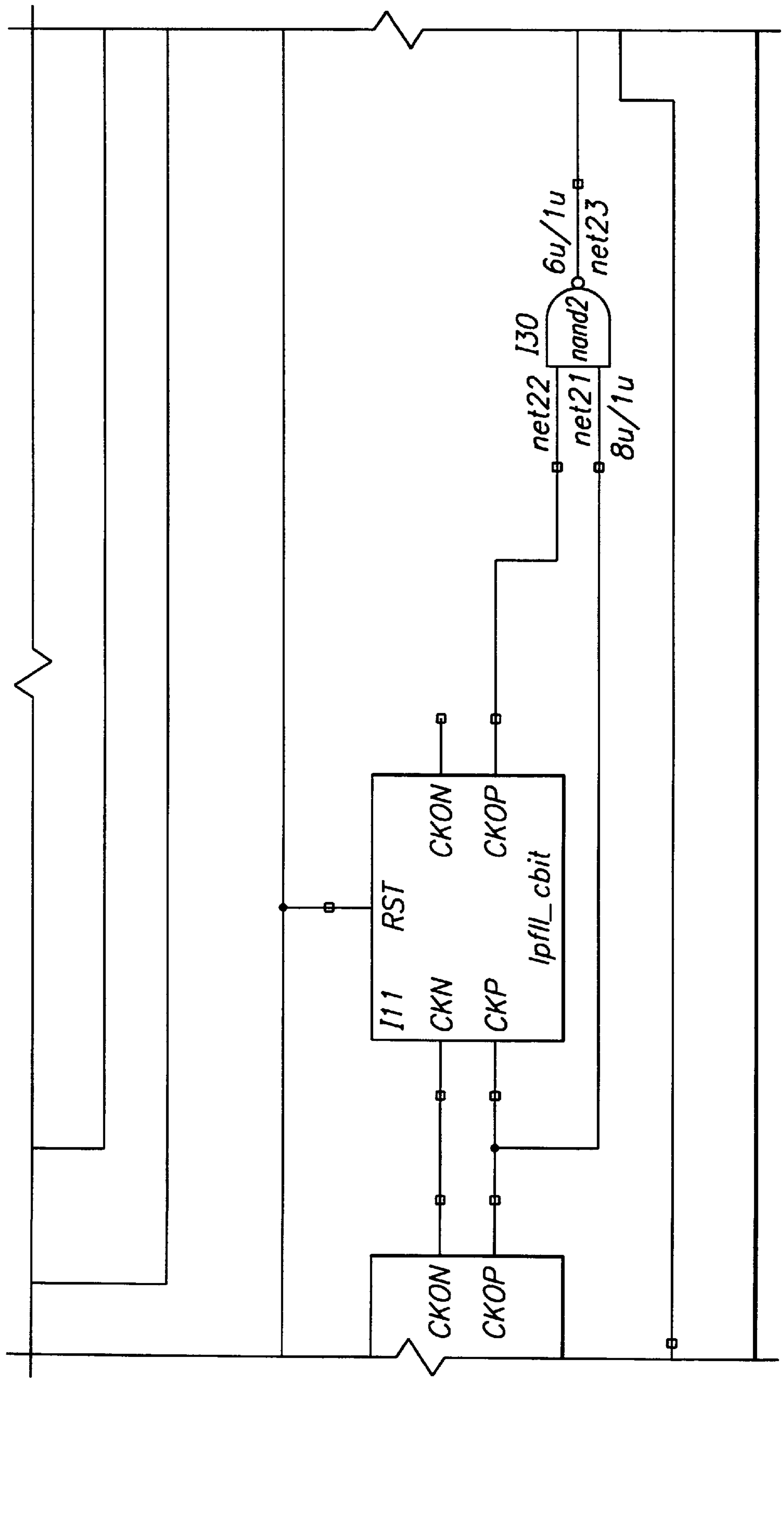
Fig. 8.002CC

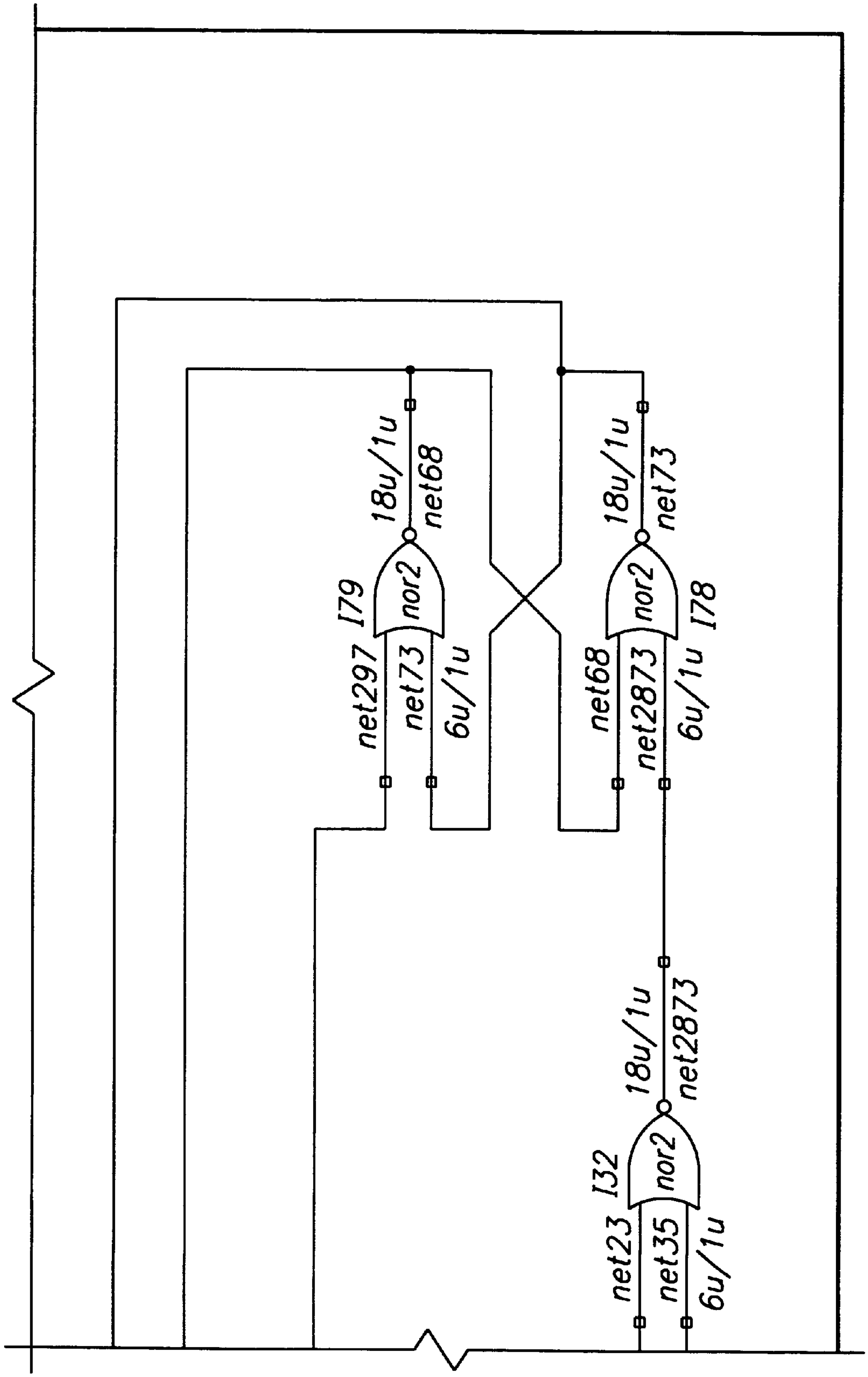
FIG. 8.0202CD

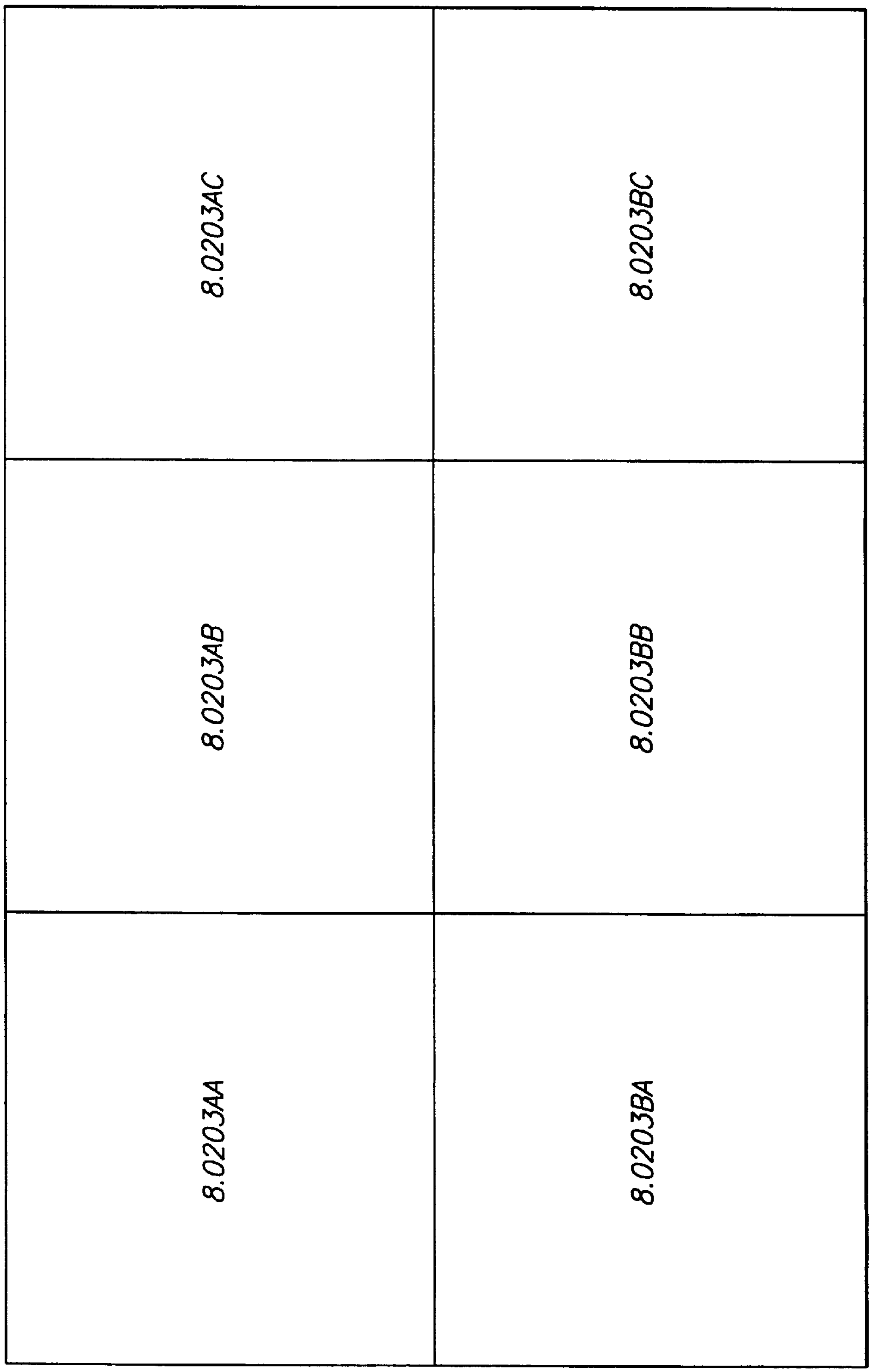
FIG. 8.0203

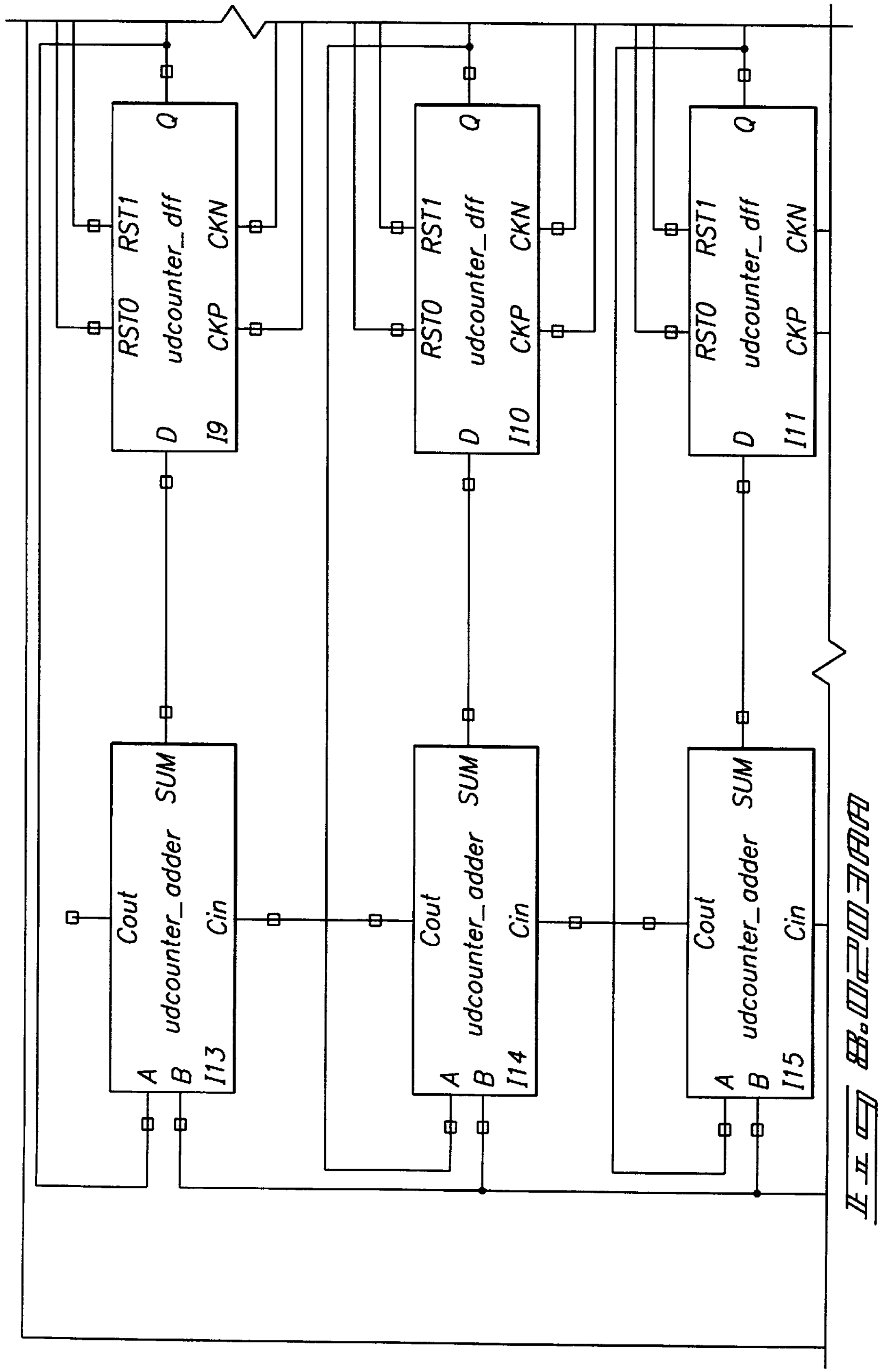
FIG. 8.020AAA

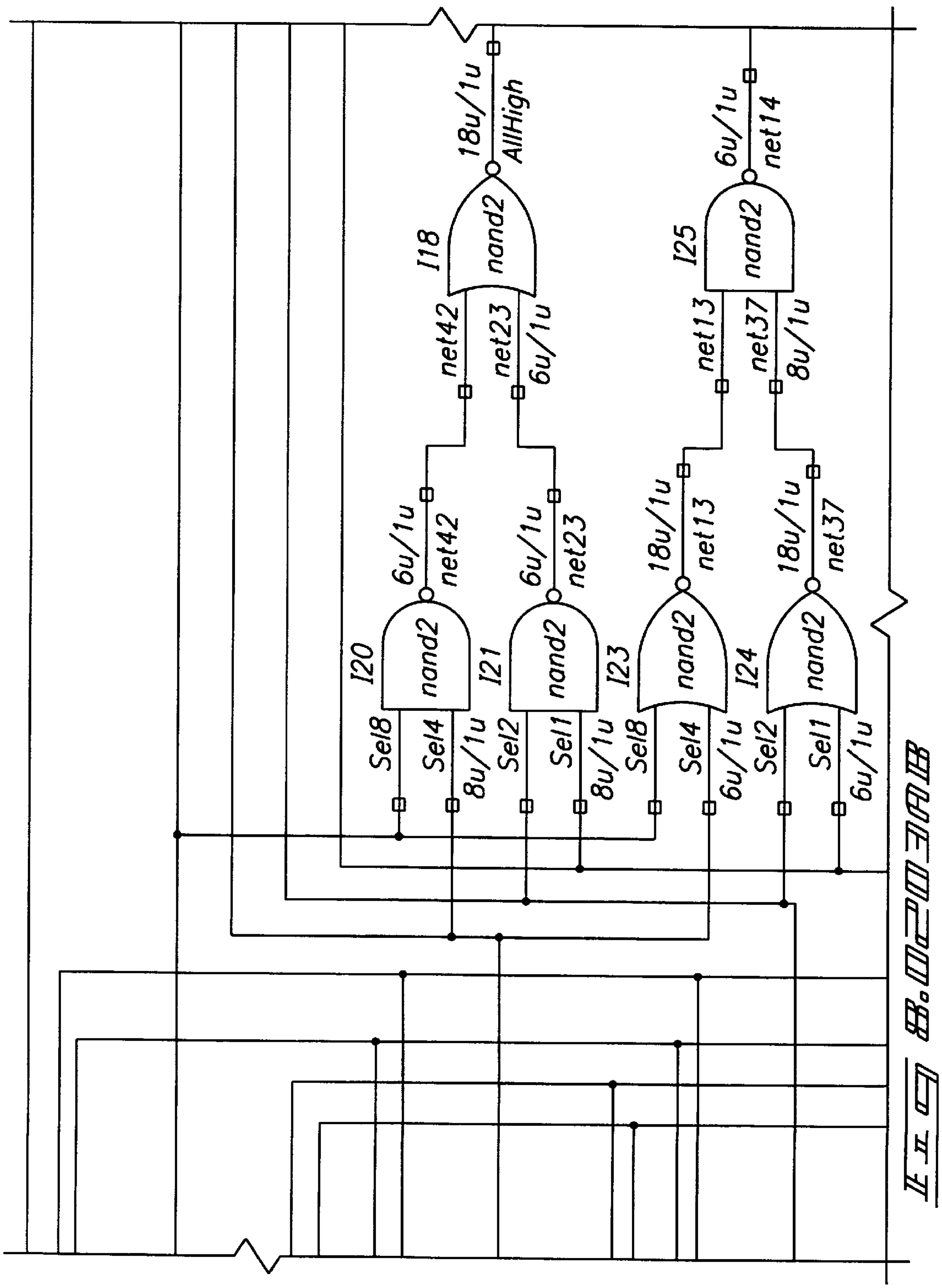
Fig. 8.0203AB

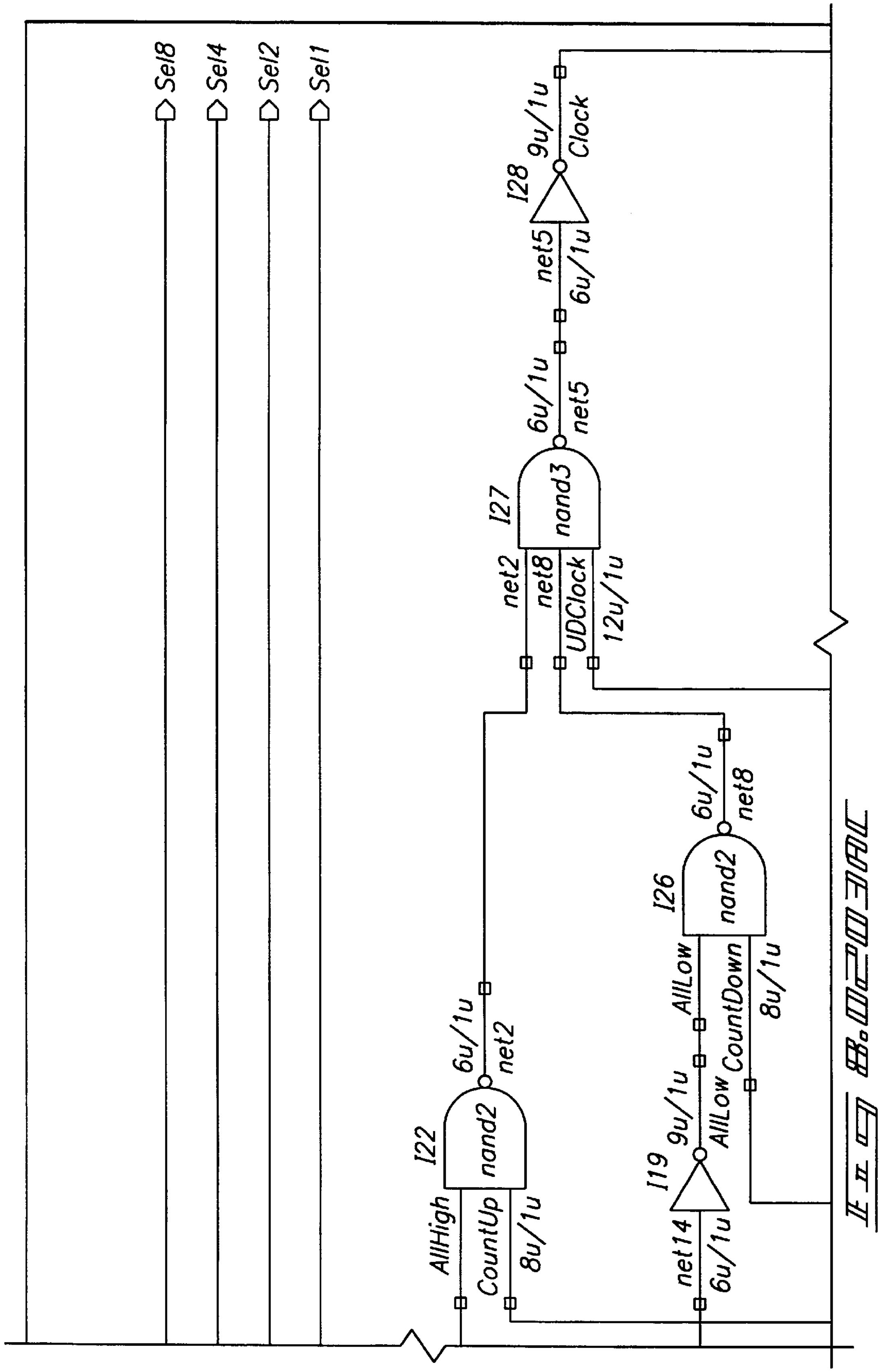
FIG. 8.0203AC

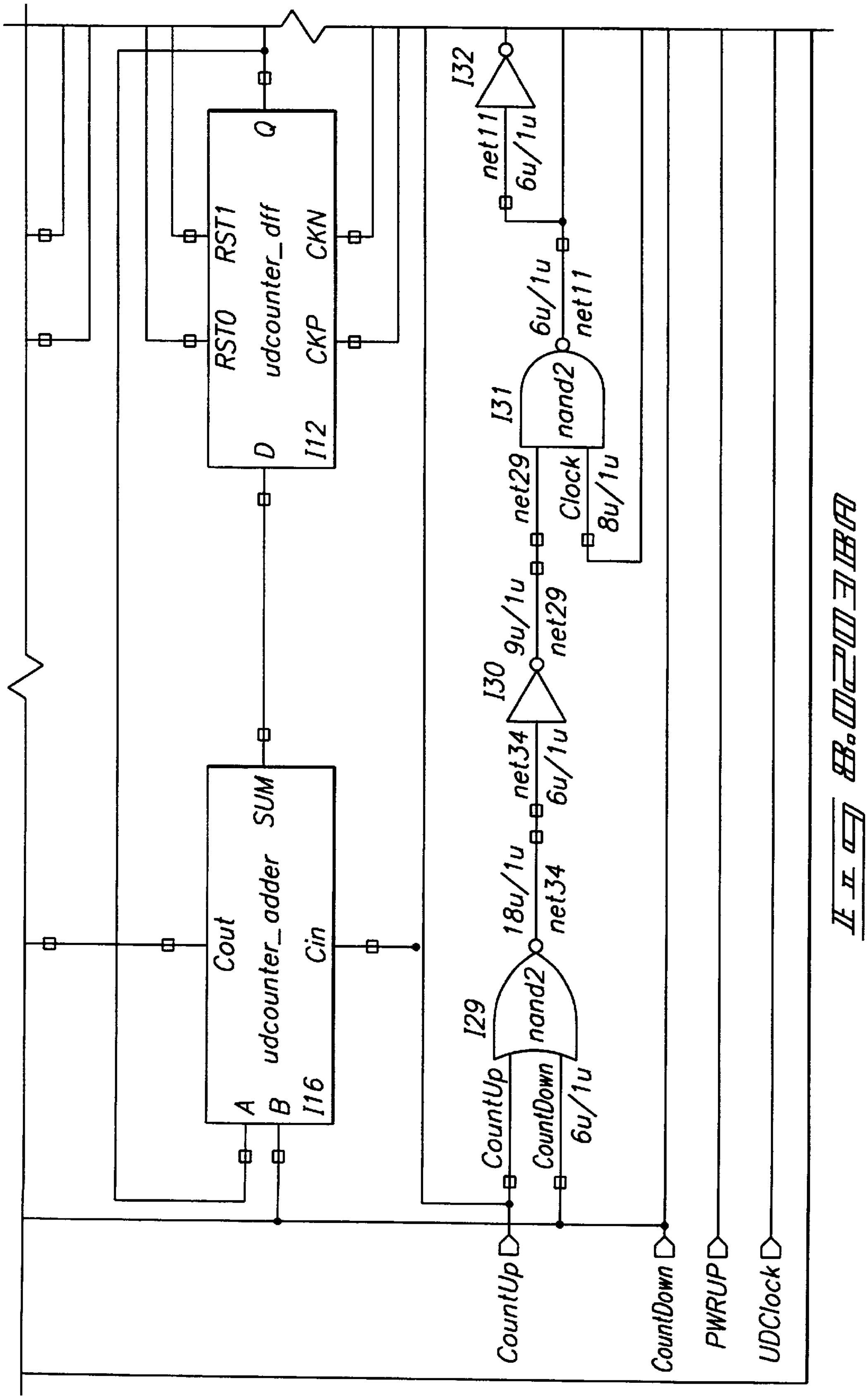
FIG. 8.020AA

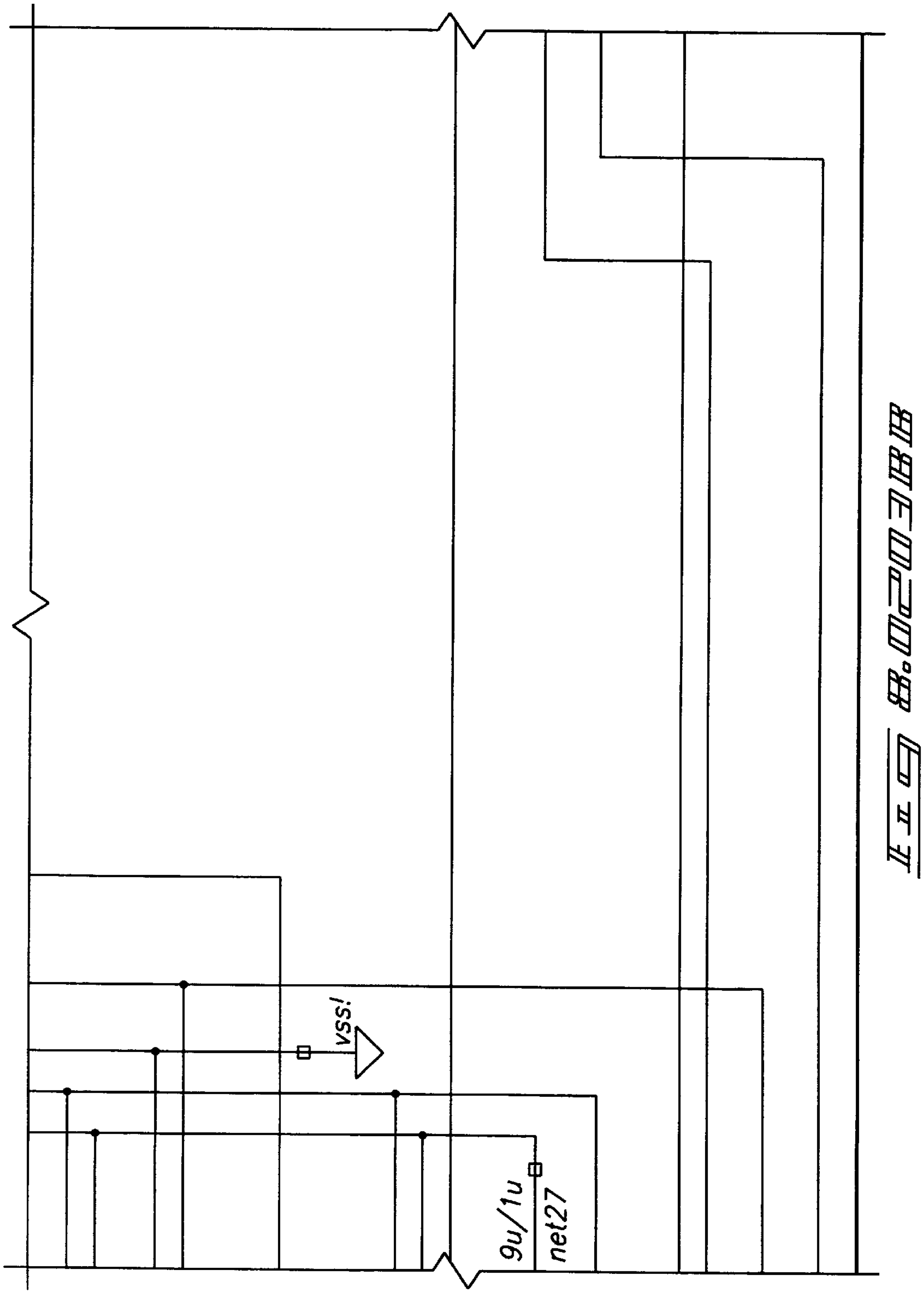
FIG. 8.0203BB

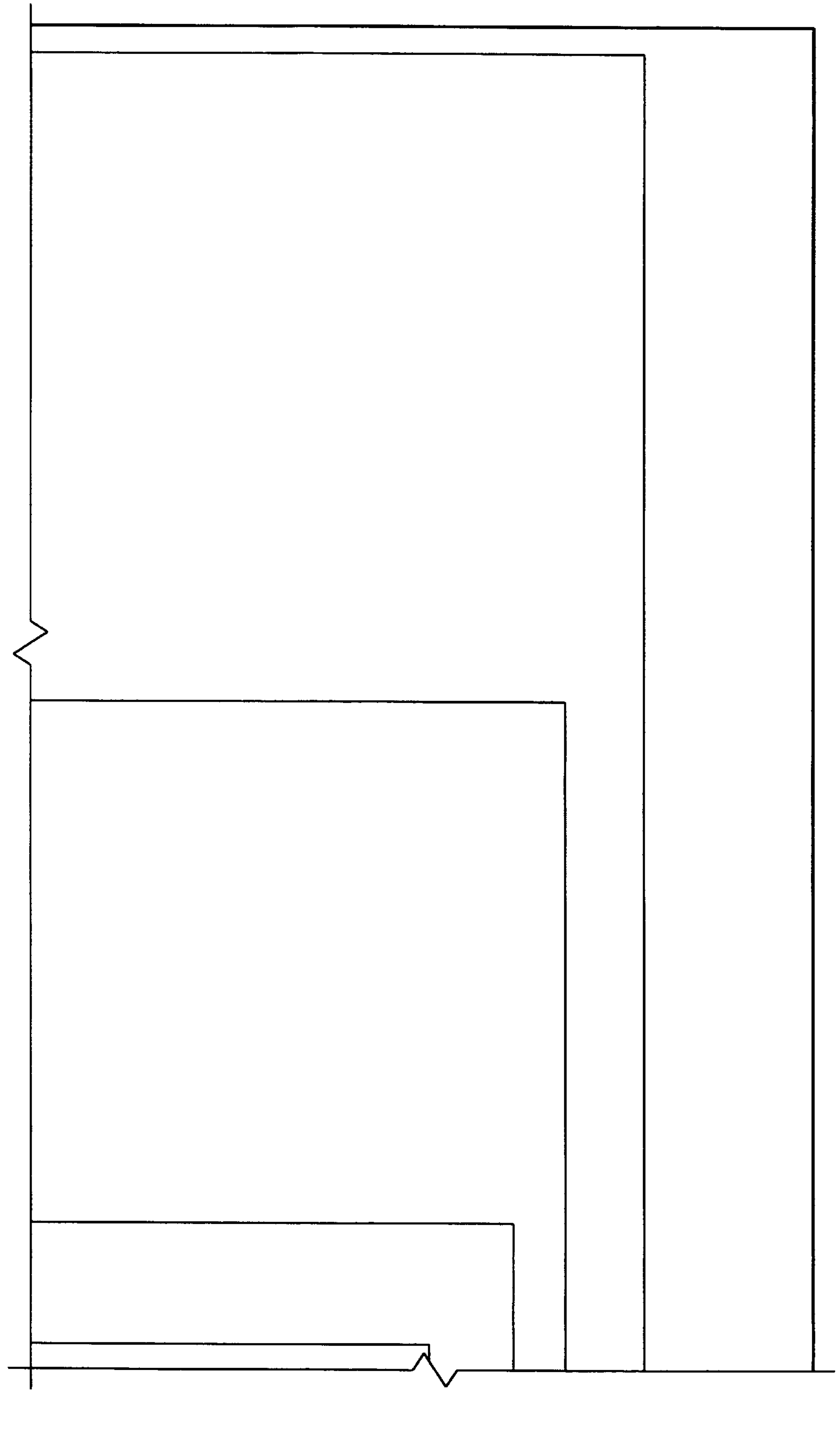
Fig. 8.0203BC

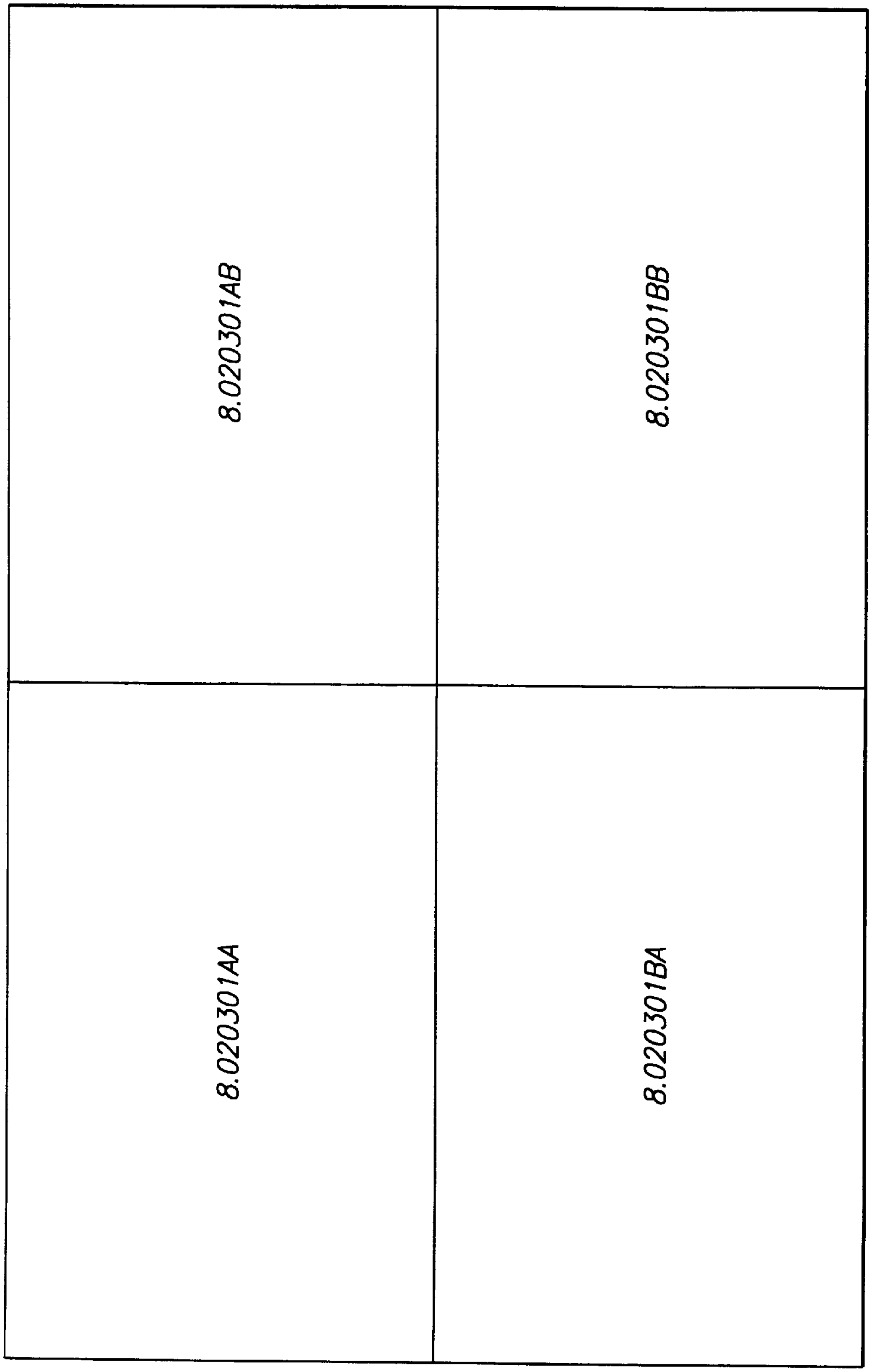
FIG. 8.020301

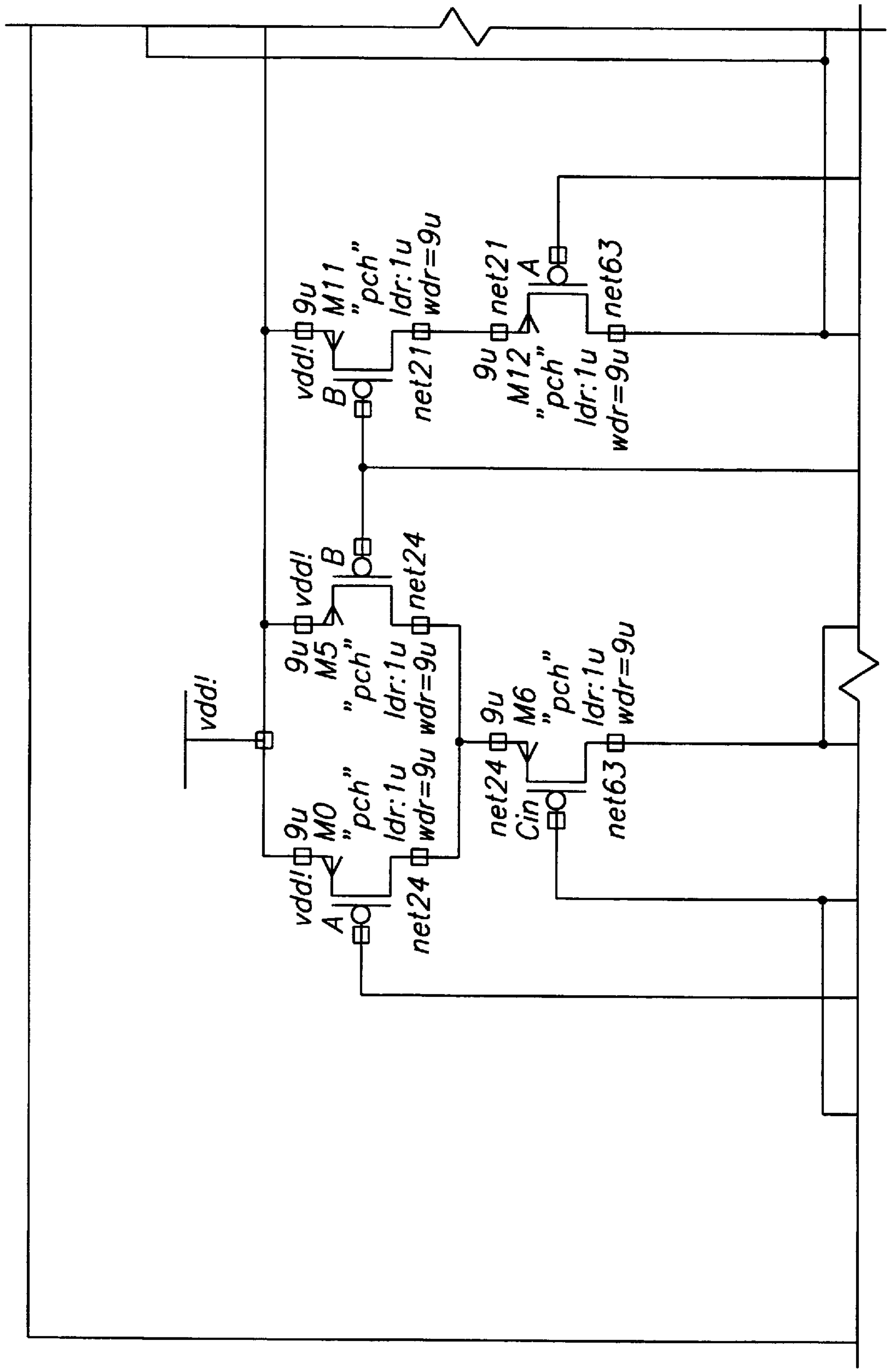
FIG 8.0202.01AA

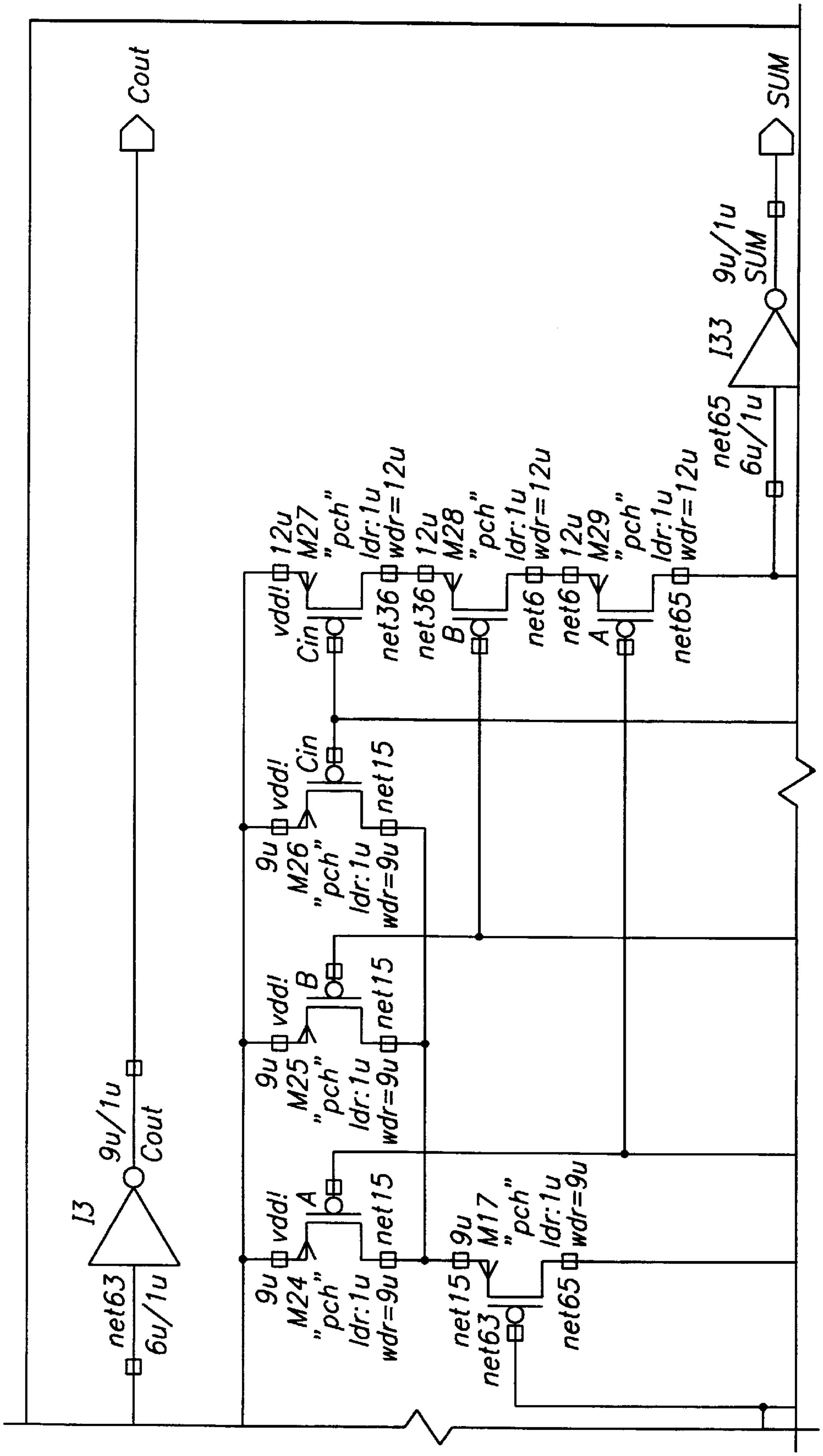
Cout
SUM
9u/1u
Cout
I3
net63
6u/1u
9u/1u
SUM
I33
net65
6u/1u
vdd!
Cin
12u
M27
"pch"
ldr:1u
wdr=12u
net36
B
M28
net6
A
M29
net65
9u
M26
ldr:1u
wdr=9u
net15
M25
M24
M17
net63

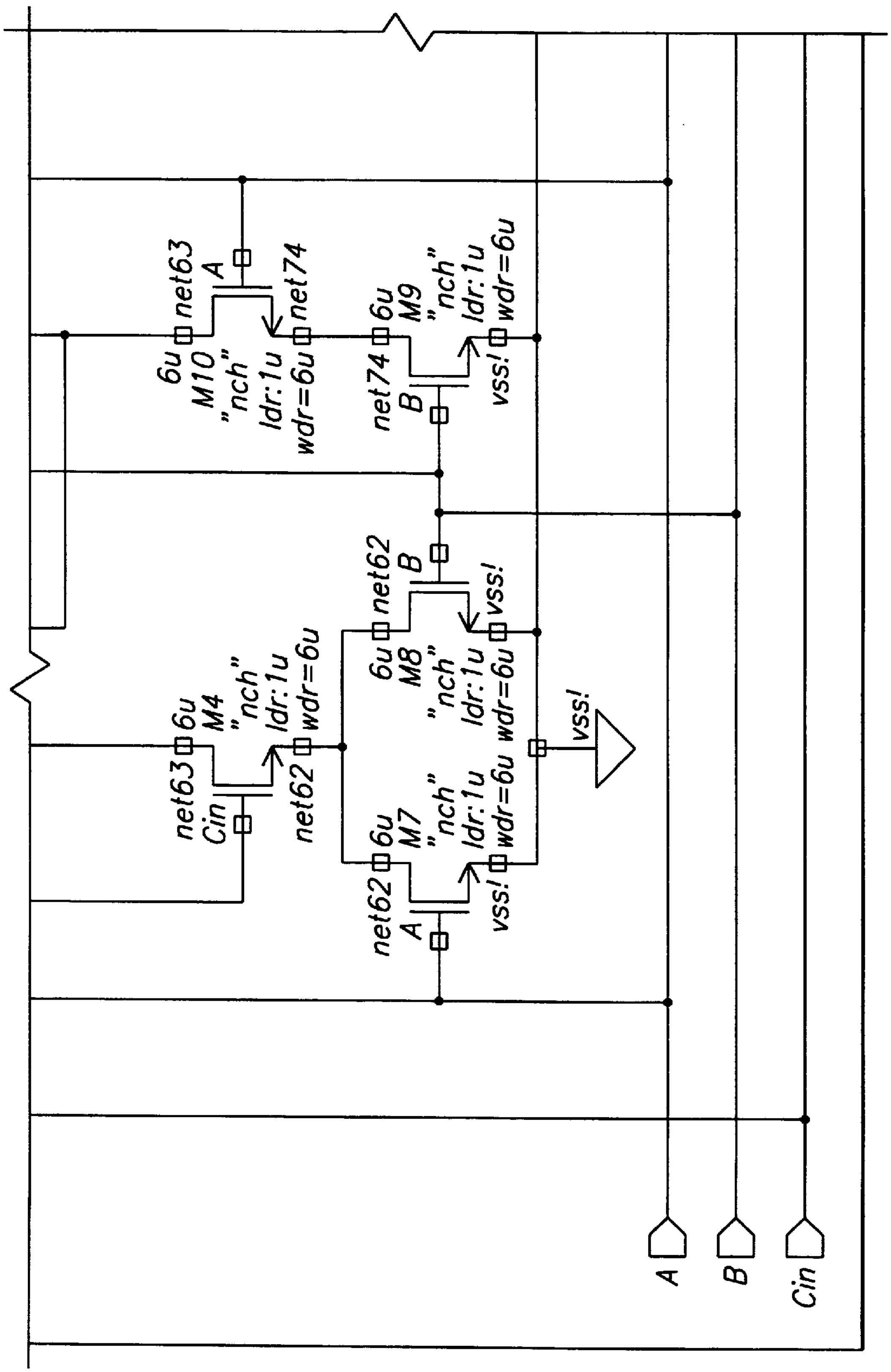
FIG. 8.02021BA

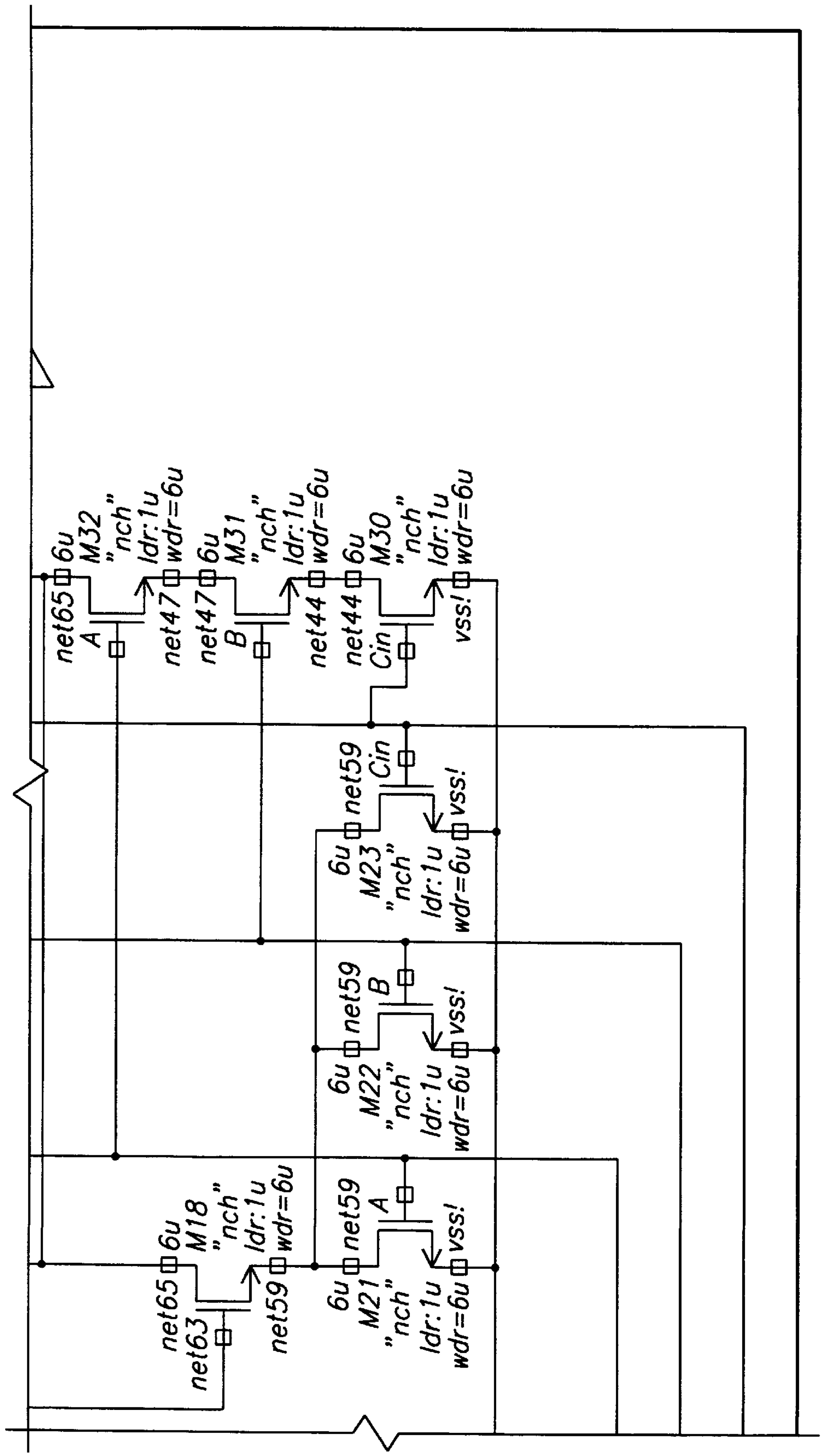
FIG. 8.020.1BB

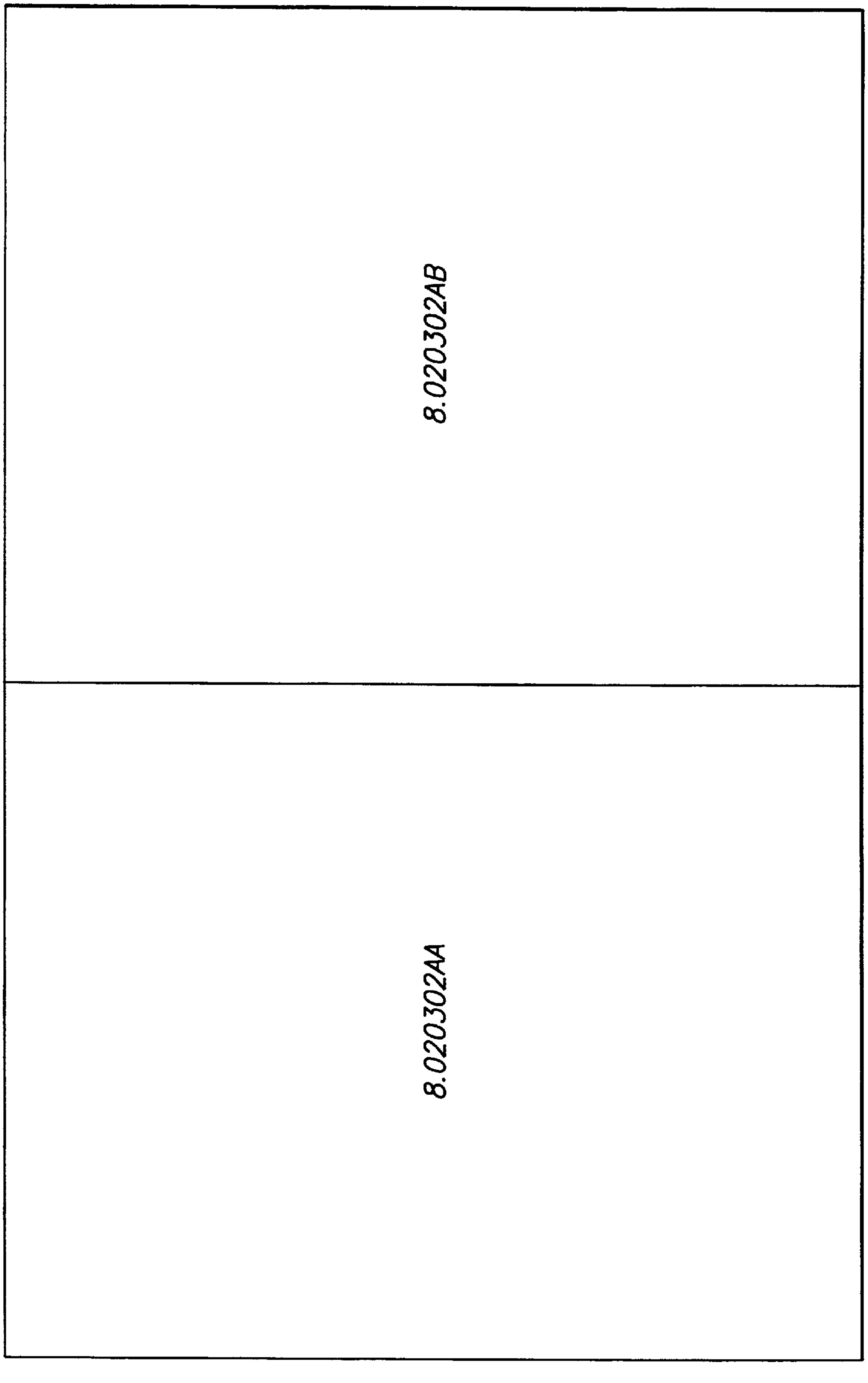
Fig. 8.020302

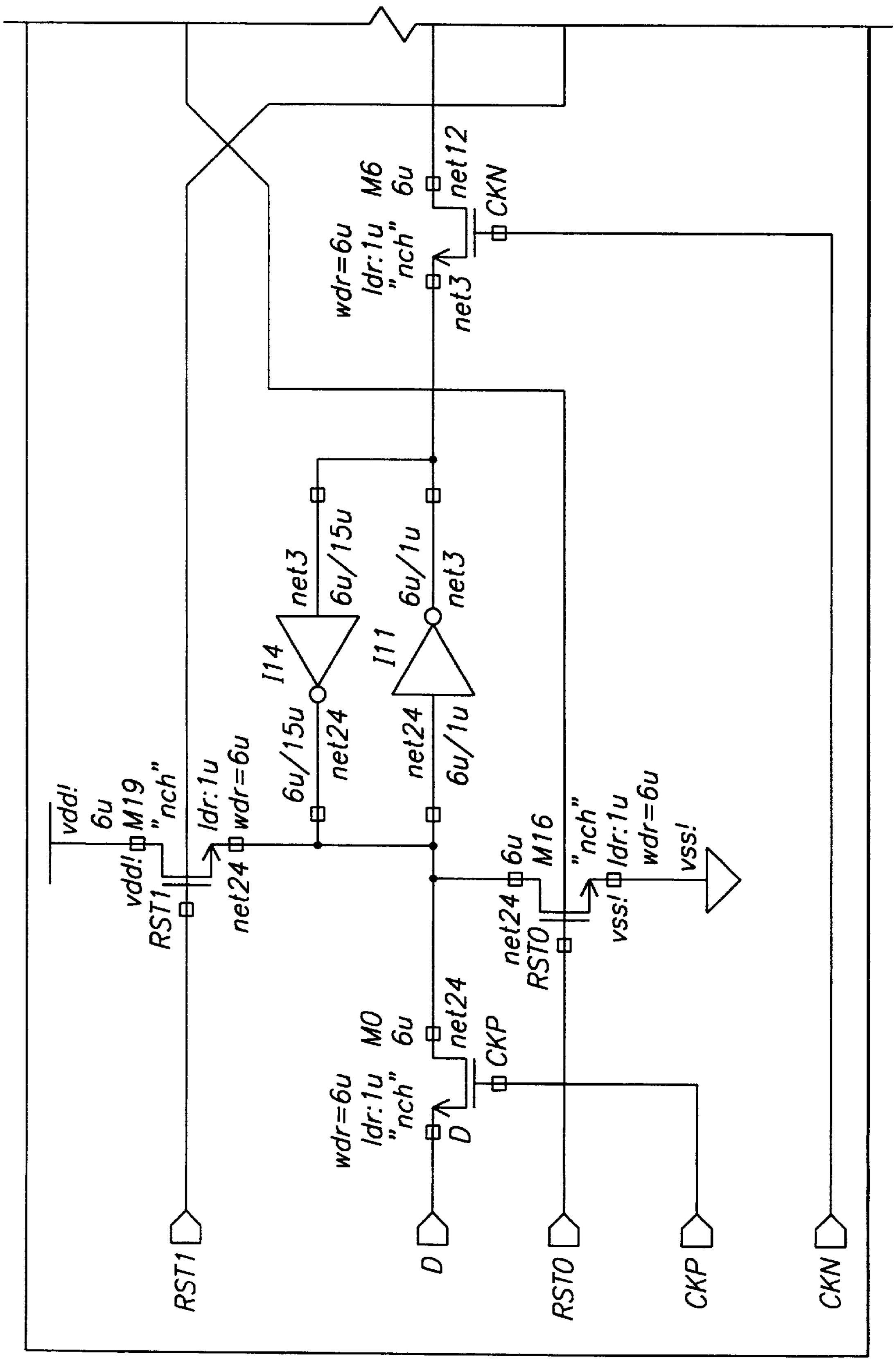
Fig. 8.020302AA

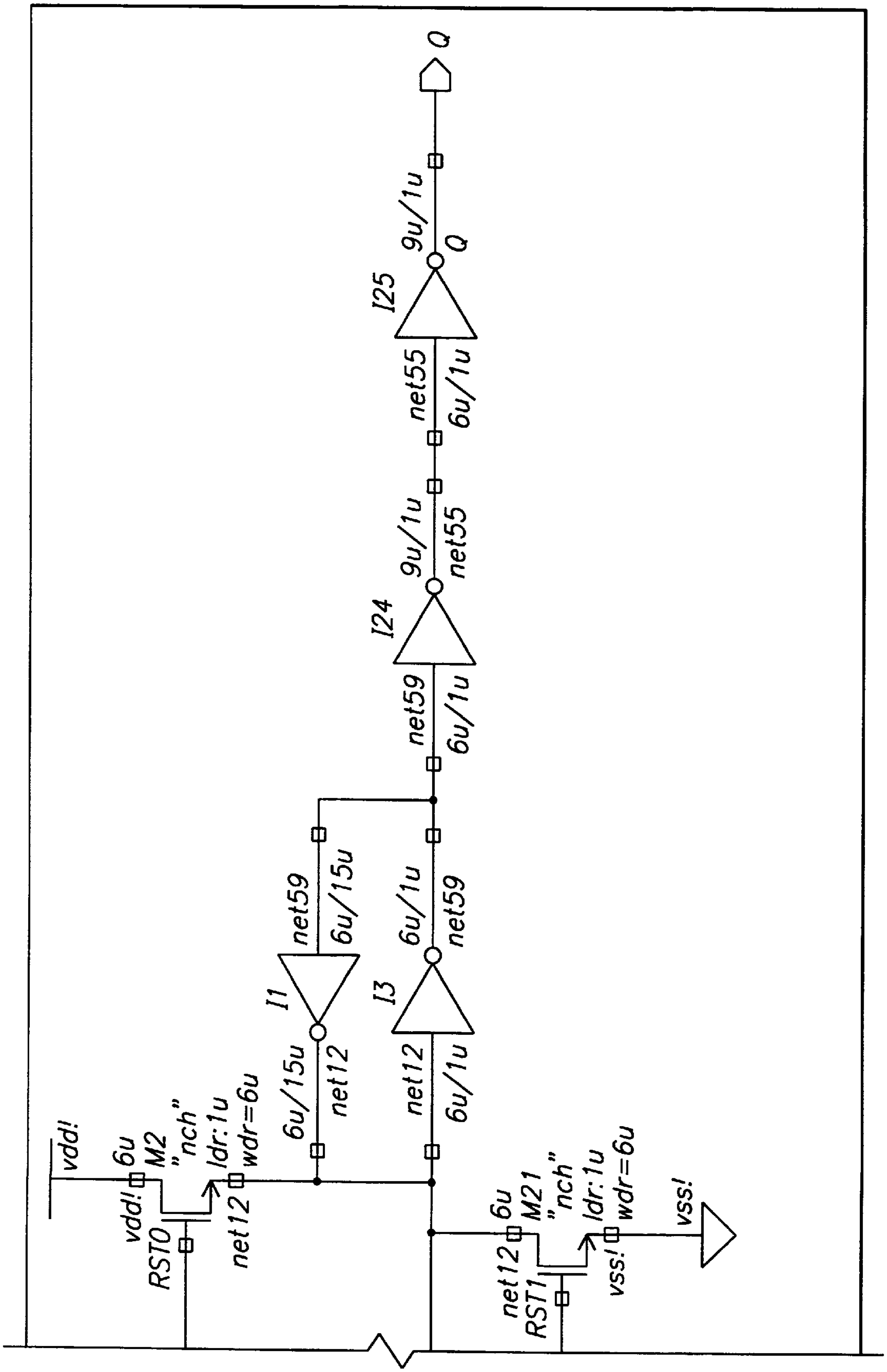
Q
9u/1u
Q
I25
net55
6u/1u
9u/1u
net55
I24
net59
6u/1u
net59
6u/15u
I1
6u/15u
net12
6u/1u
net59
I3
net12
6u/1u
vdd!
6u
M2
"nch"
ldr:1u
wdr=6u
vdd!
RST0
net12
6u
M21
"nch"
ldr:1u
wdr=6u
vss!
net12
RST1
vss!

| | | | | | | | | | |
|---|---|---|---|---|---|---|---|---|---|
| 8.0204AA | 8.0204AB | 8.0204AC | 8.0204AD | 8.0204AE | 8.0204AF | 8.0204AG | 8.0204AH | 8.0204AI | 8.0204AJ |
| 8.0204BA | 8.0204BB | 8.0204BC | 8.0204BD | 8.0204BE | 8.0204BF | 8.0204BG | 8.0204BH | 8.0204BI | |
| 8.0204CA | 8.0204CB | 8.0204CC | 8.0204CD | 8.0204CE | 8.0204CF | 8.0204CG | 8.0204CH | 8.0204CI | |
| 8.0204DA | 8.0204DB | 8.0204DC | 8.0204DD | 8.0204DE | 8.0204DF | 8.0204DG | 8.0204DH | 8.0204DI | |
| 8.0204EA | 8.0204EB | 8.0204EC | 8.0204ED | 8.0204EE | 8.0204EF | 8.0204EG | 8.0204EH | 8.0204EI | 8.0204EJ |

Fig 8.0204

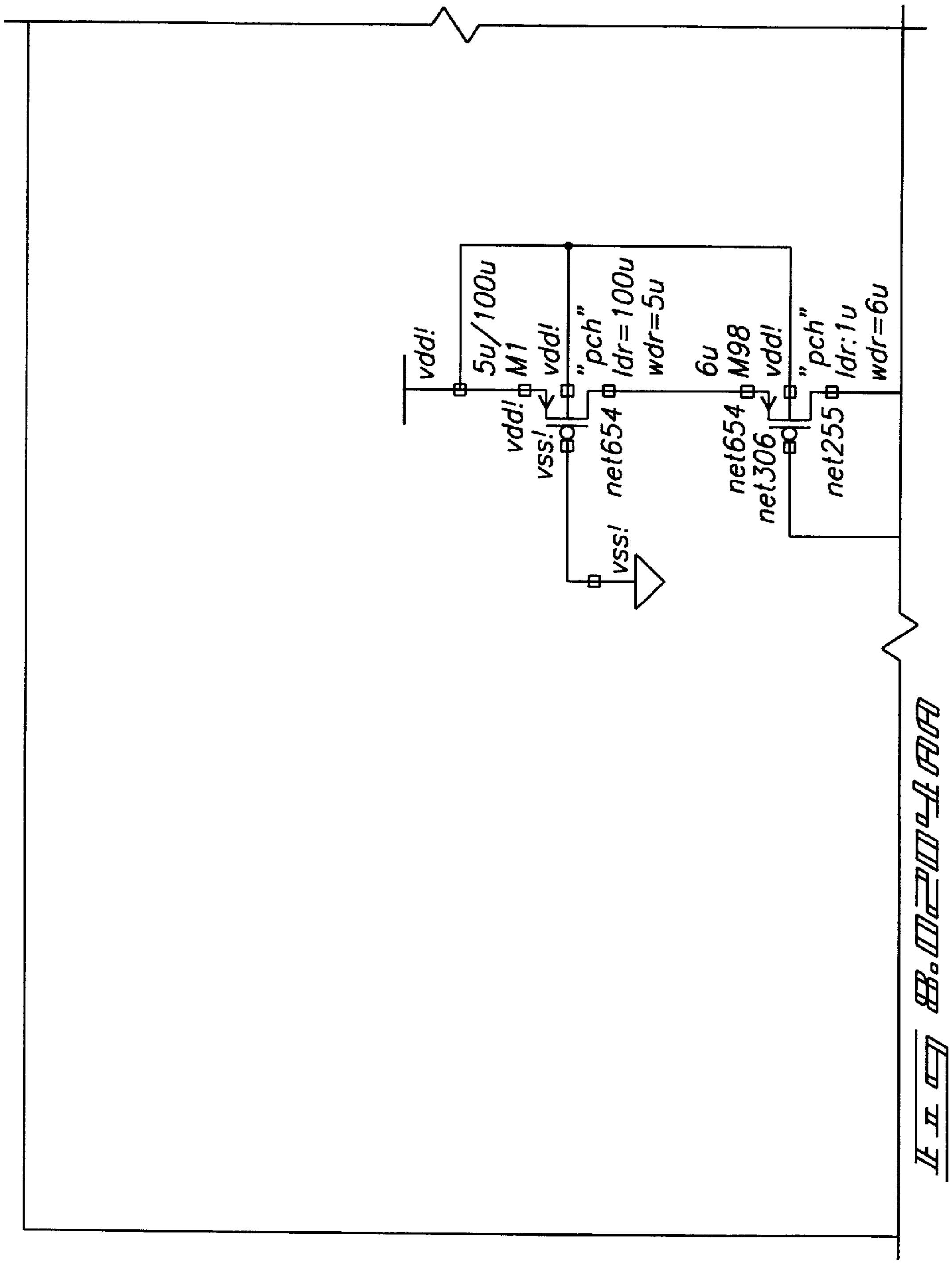
FIG. 8.0204AA

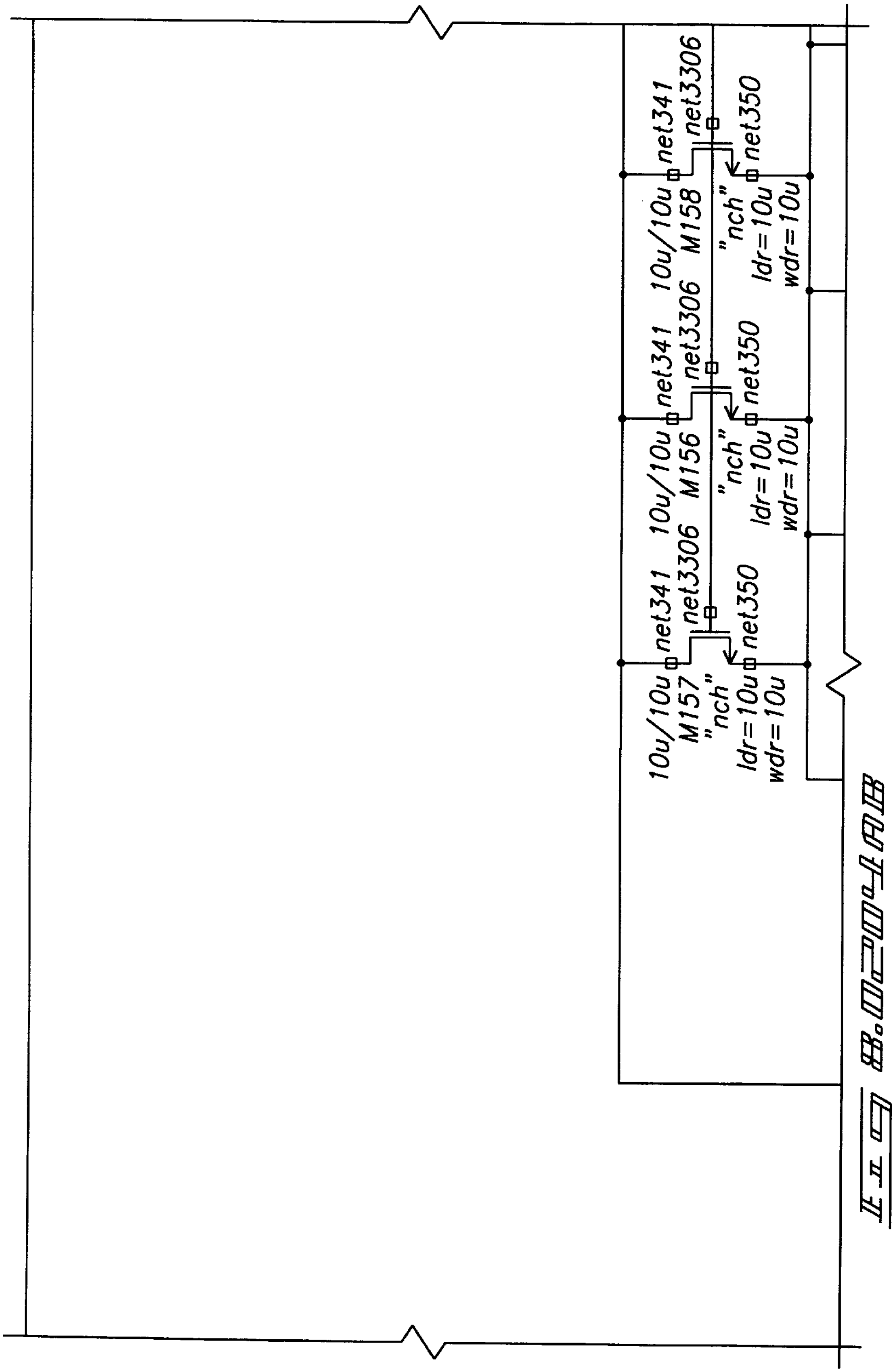
FIG. 8.0204AB

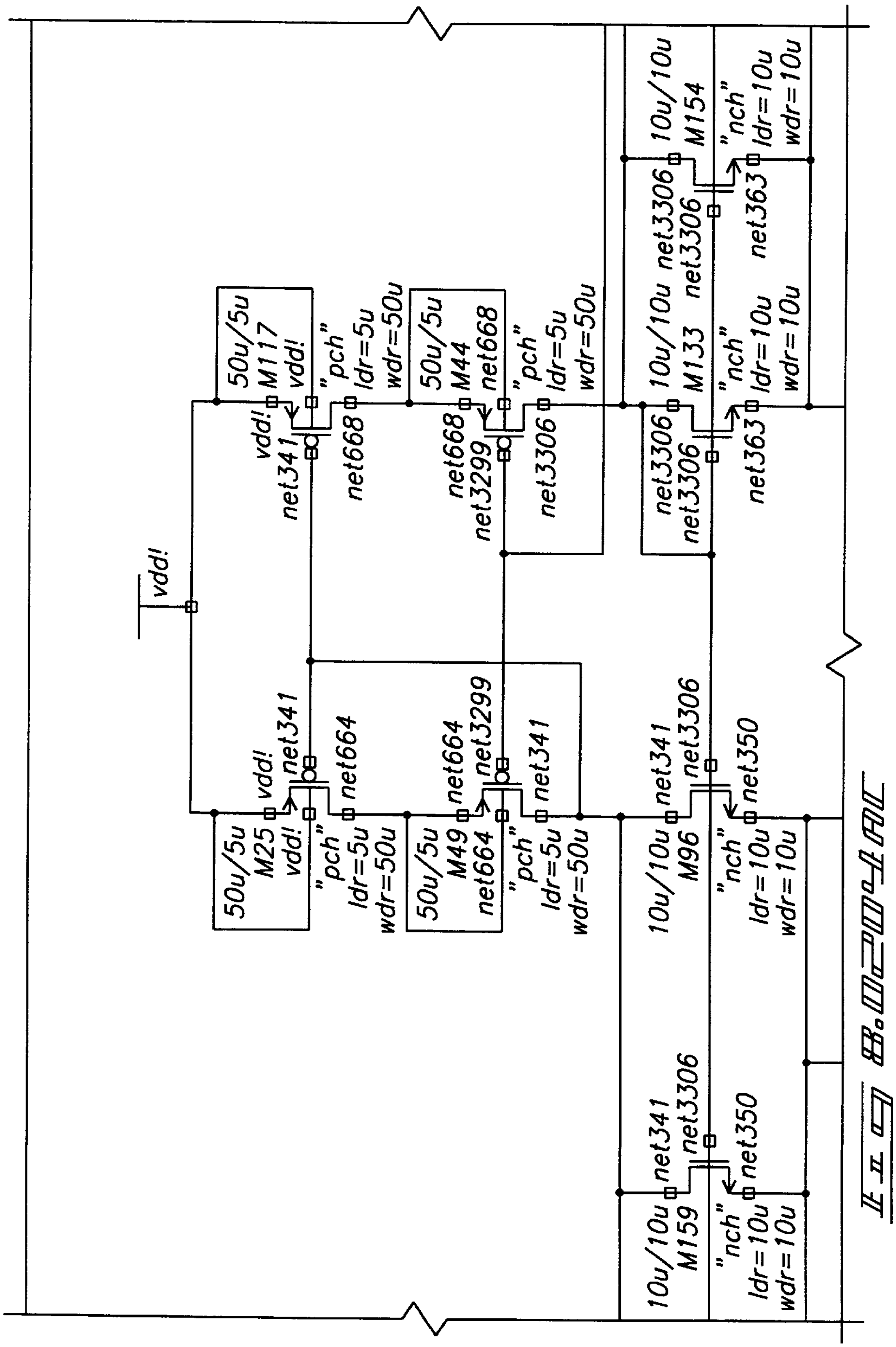
FIG. 8.0204AC

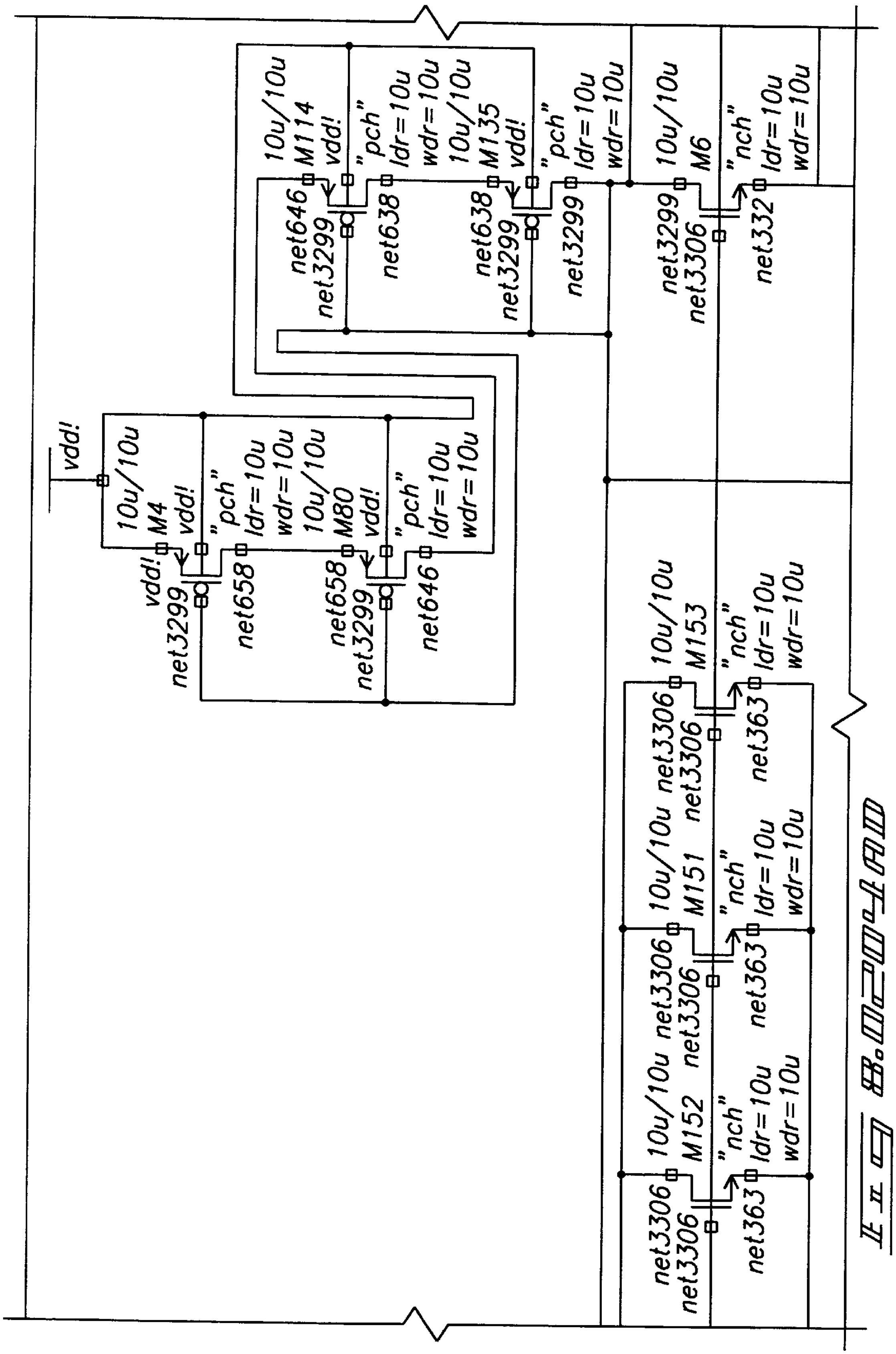
vdd!
10u/10u
M4
vdd!
"pch"
ldr=10u
wdr=10u
M80
net3299
net658
net646
net638
M114
M135
M6
"nch"
net3306
net332
M153
M151
M152
net363

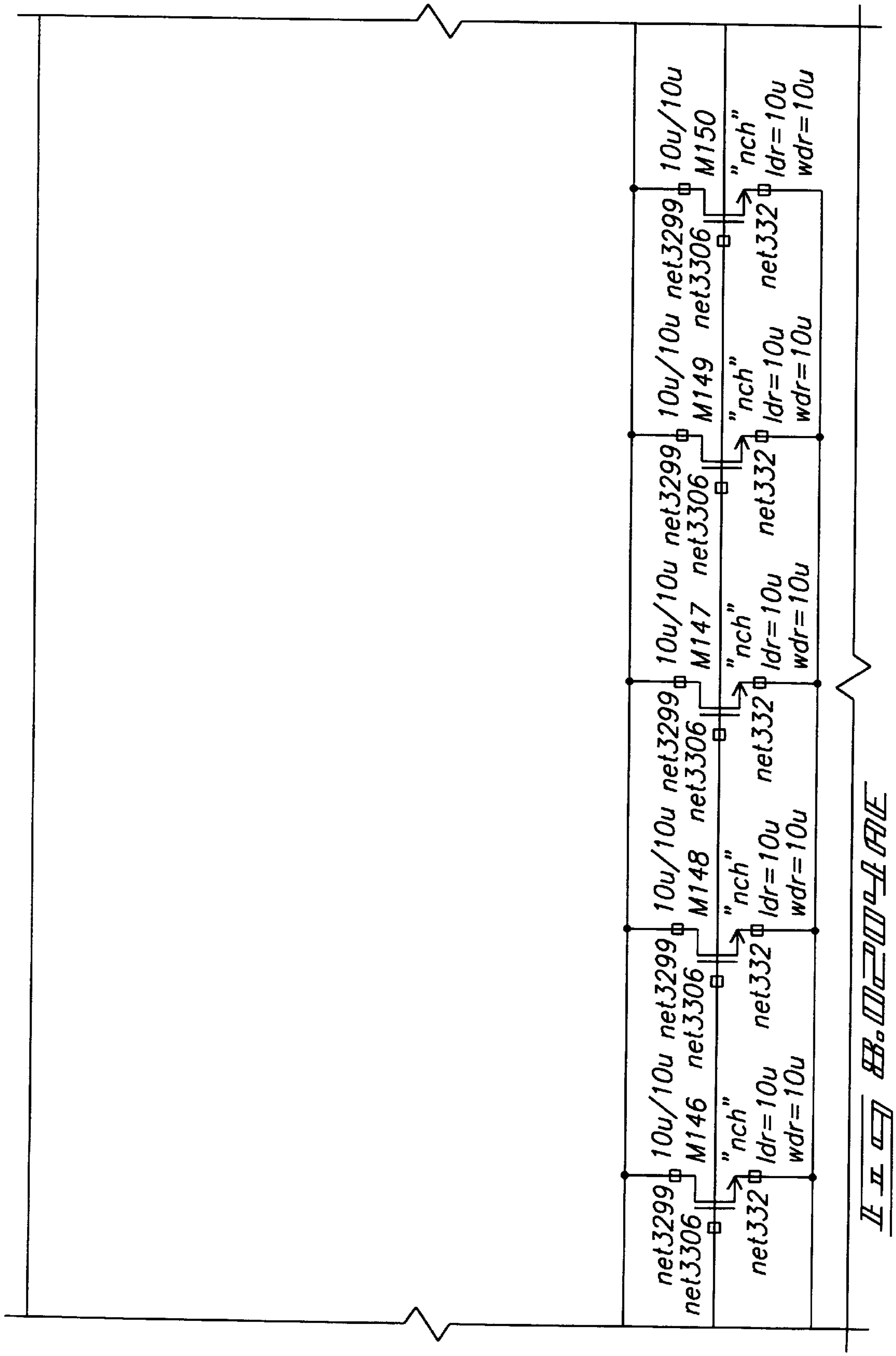
FIG. 8.0204AE

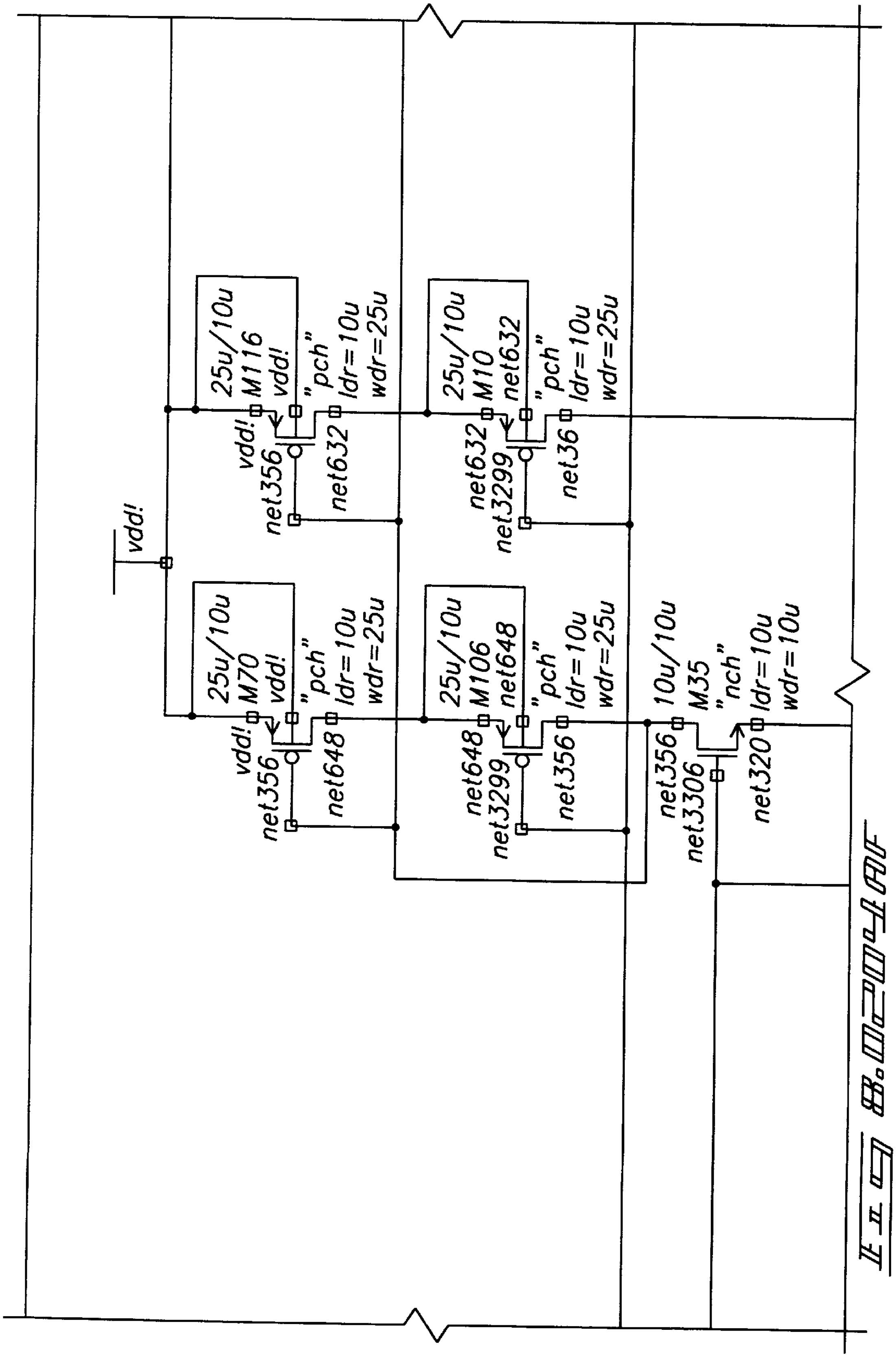
FIG. 8.004AF

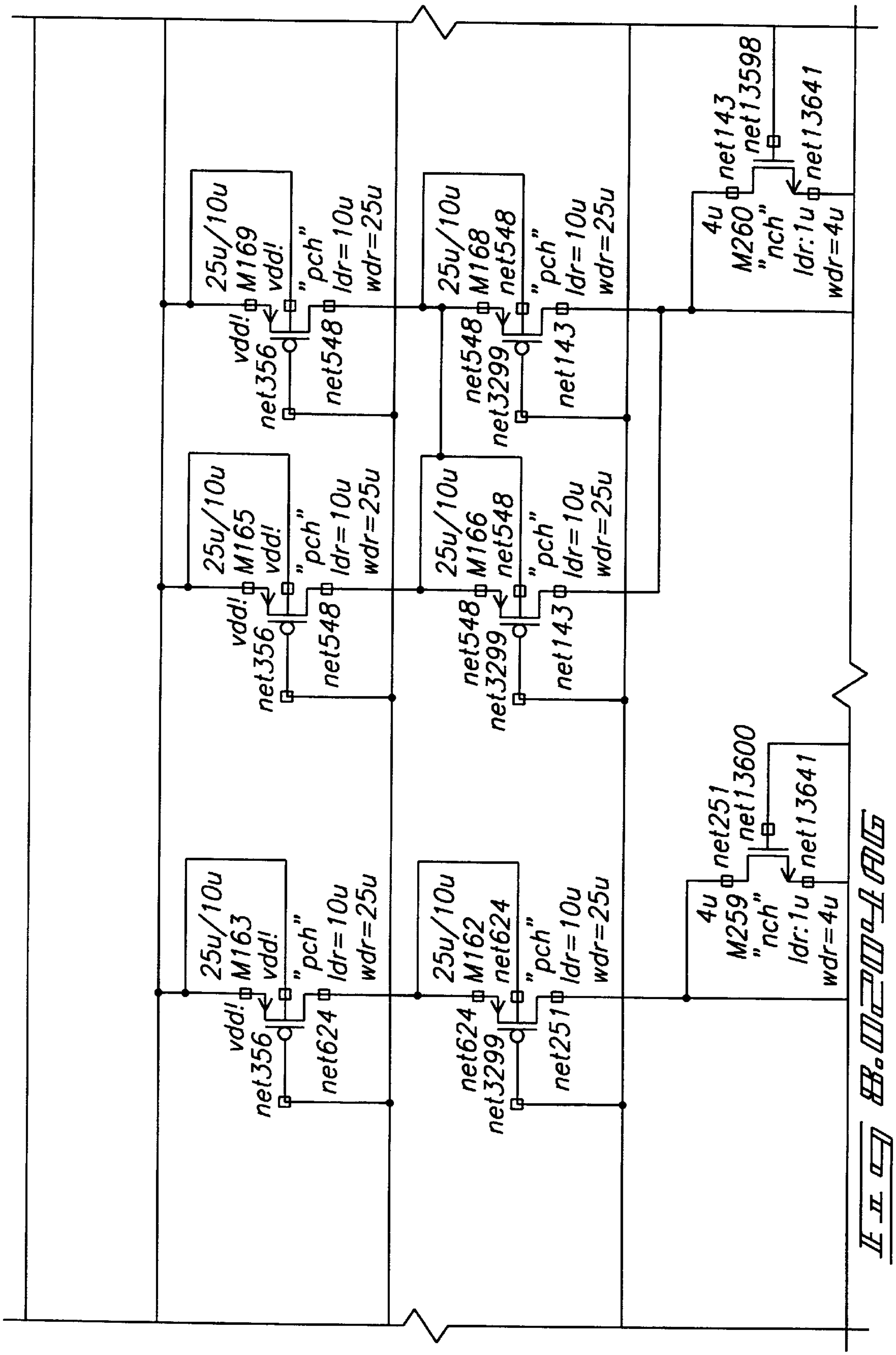
FIG. 8.0204AG

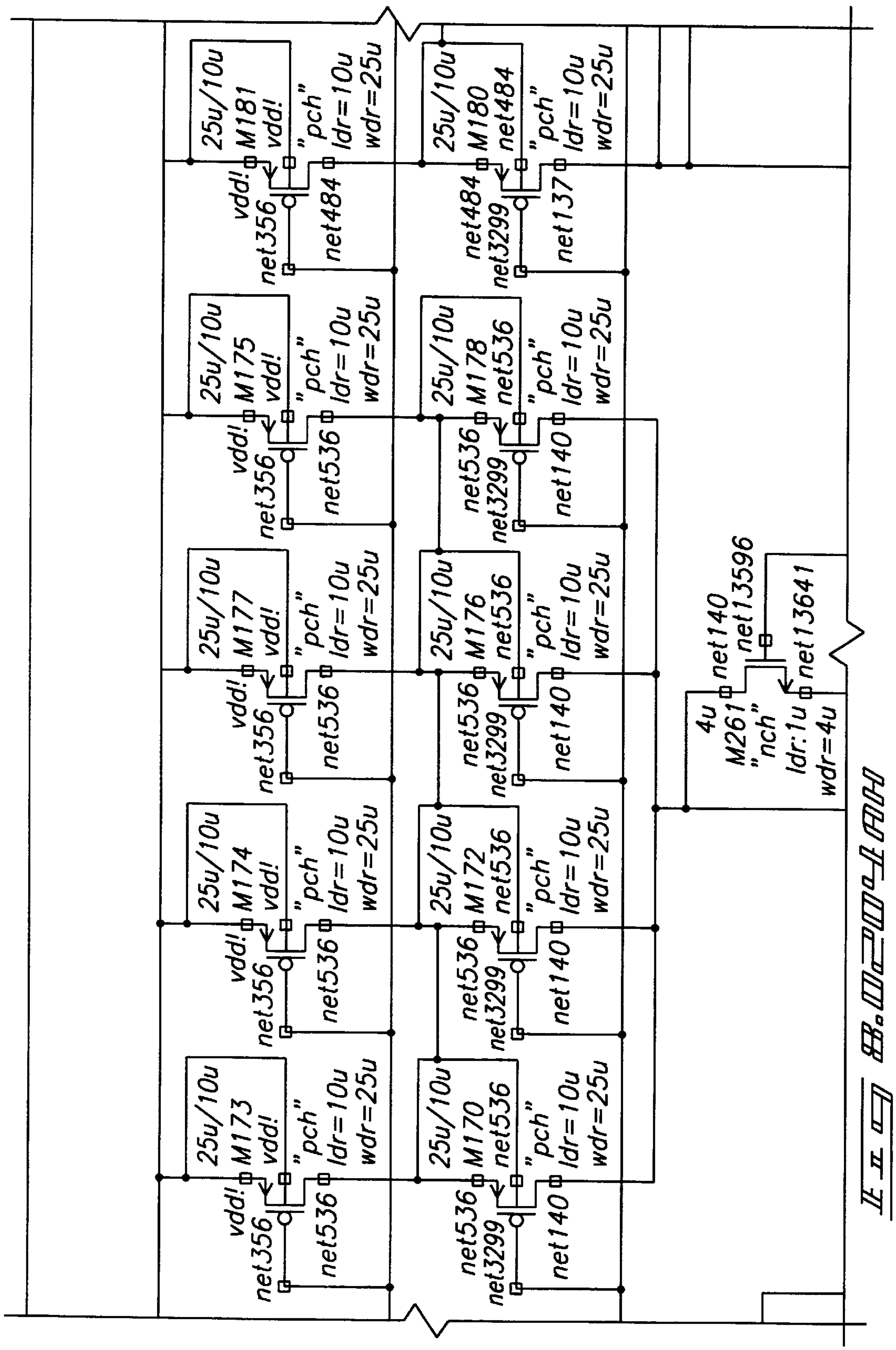
FIG. 8.8204AH

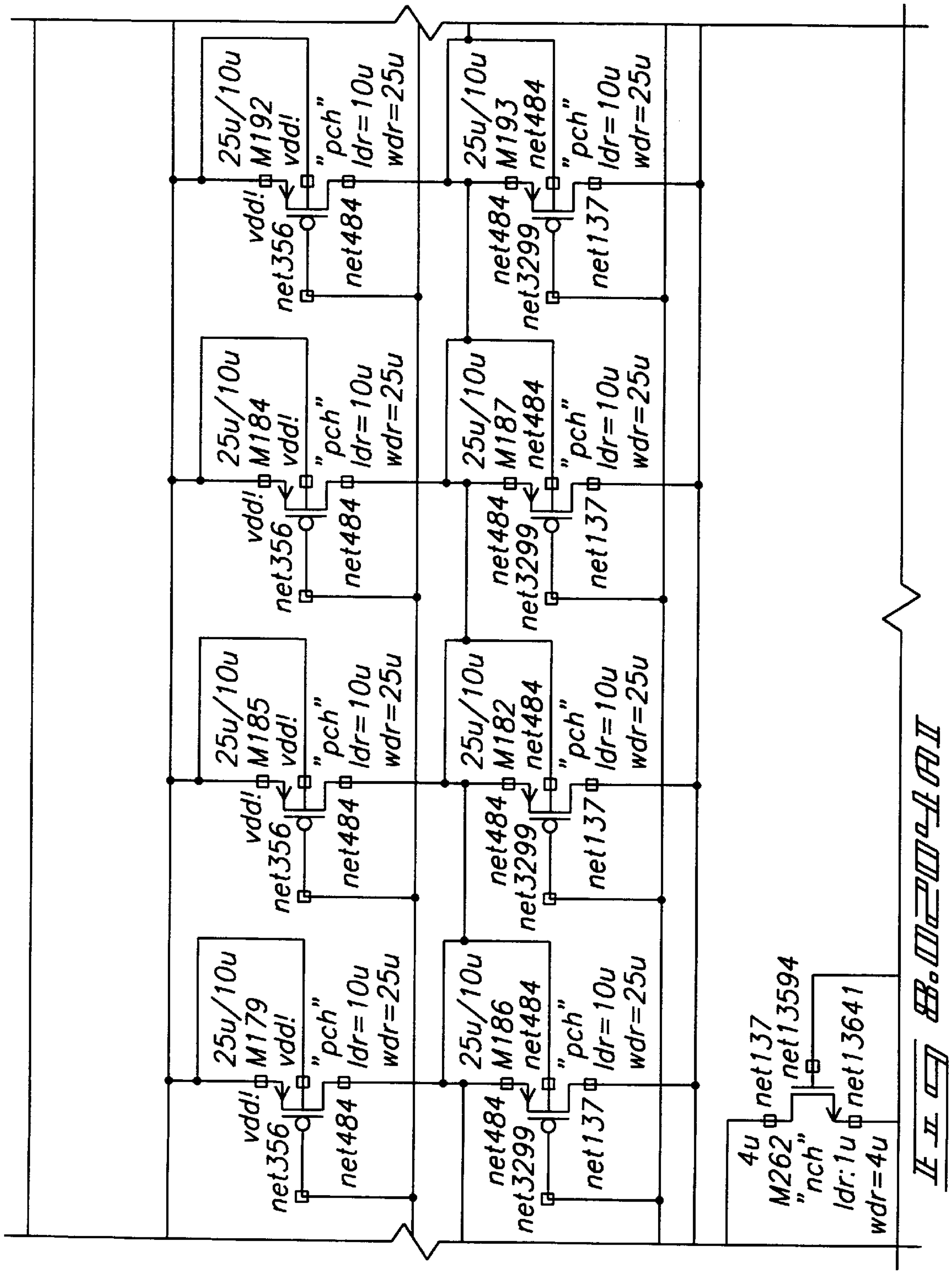
FIG. 8.204AI

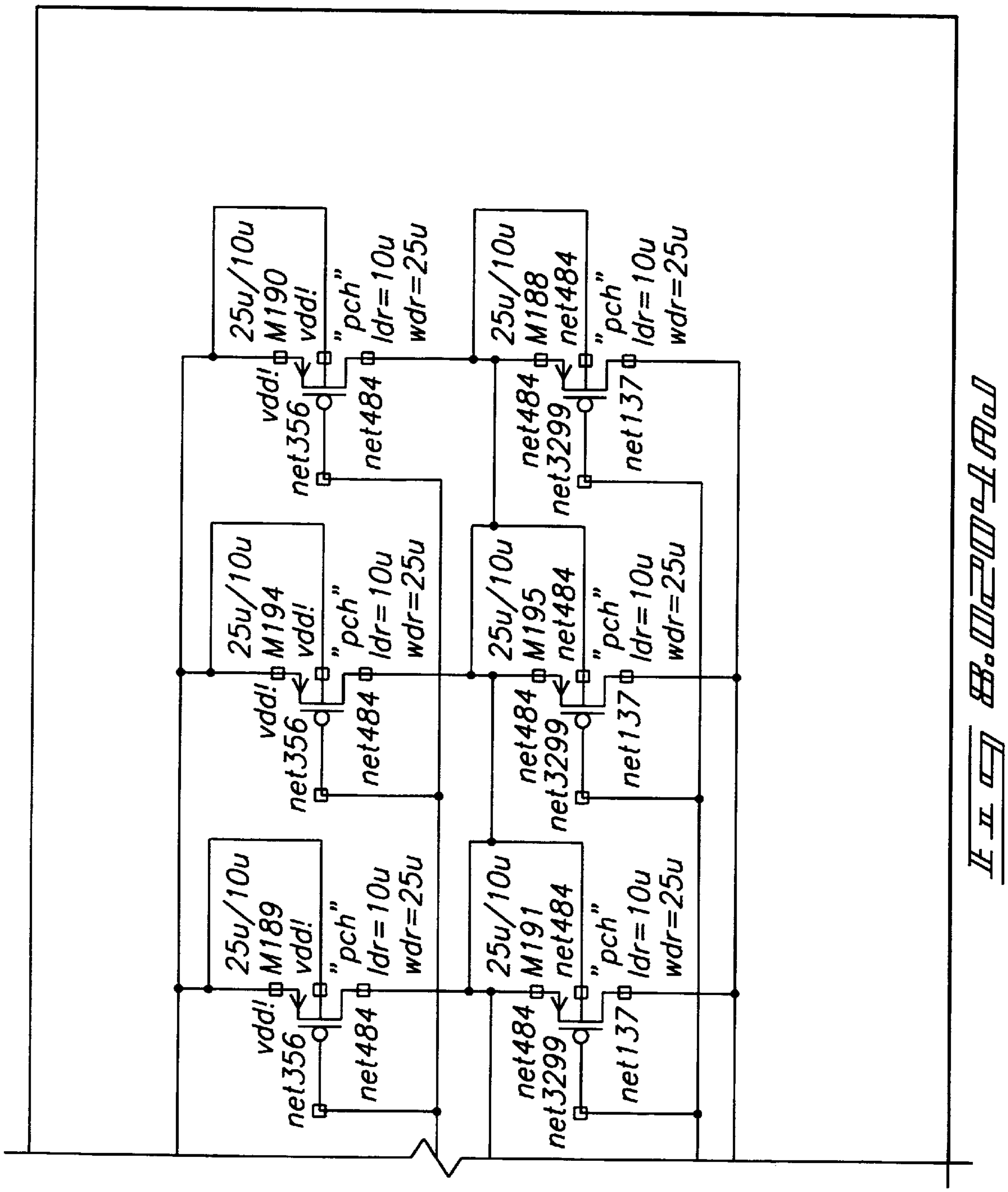
Fig. 8.020.4AJ

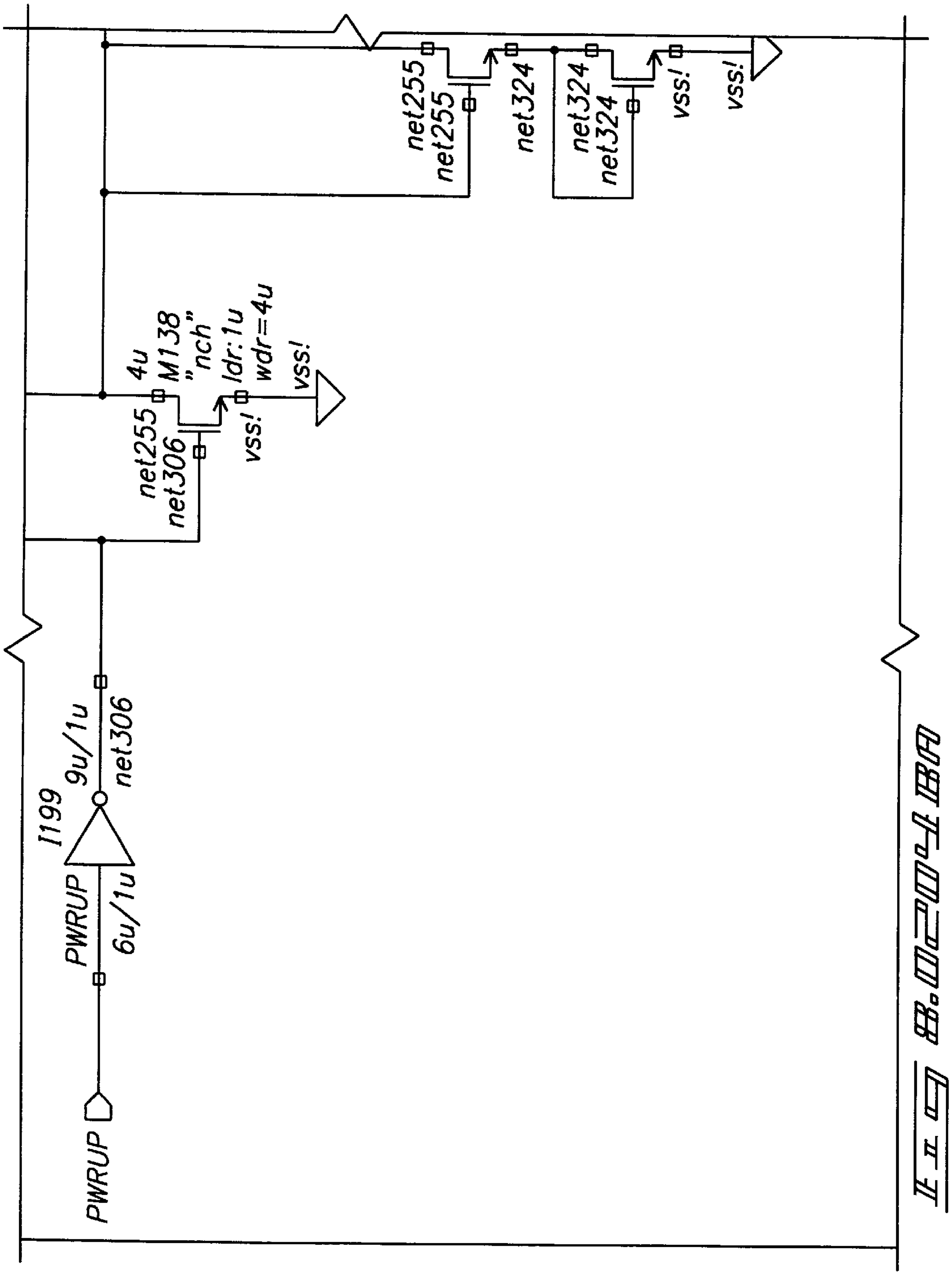
Fig. 8.0204BA

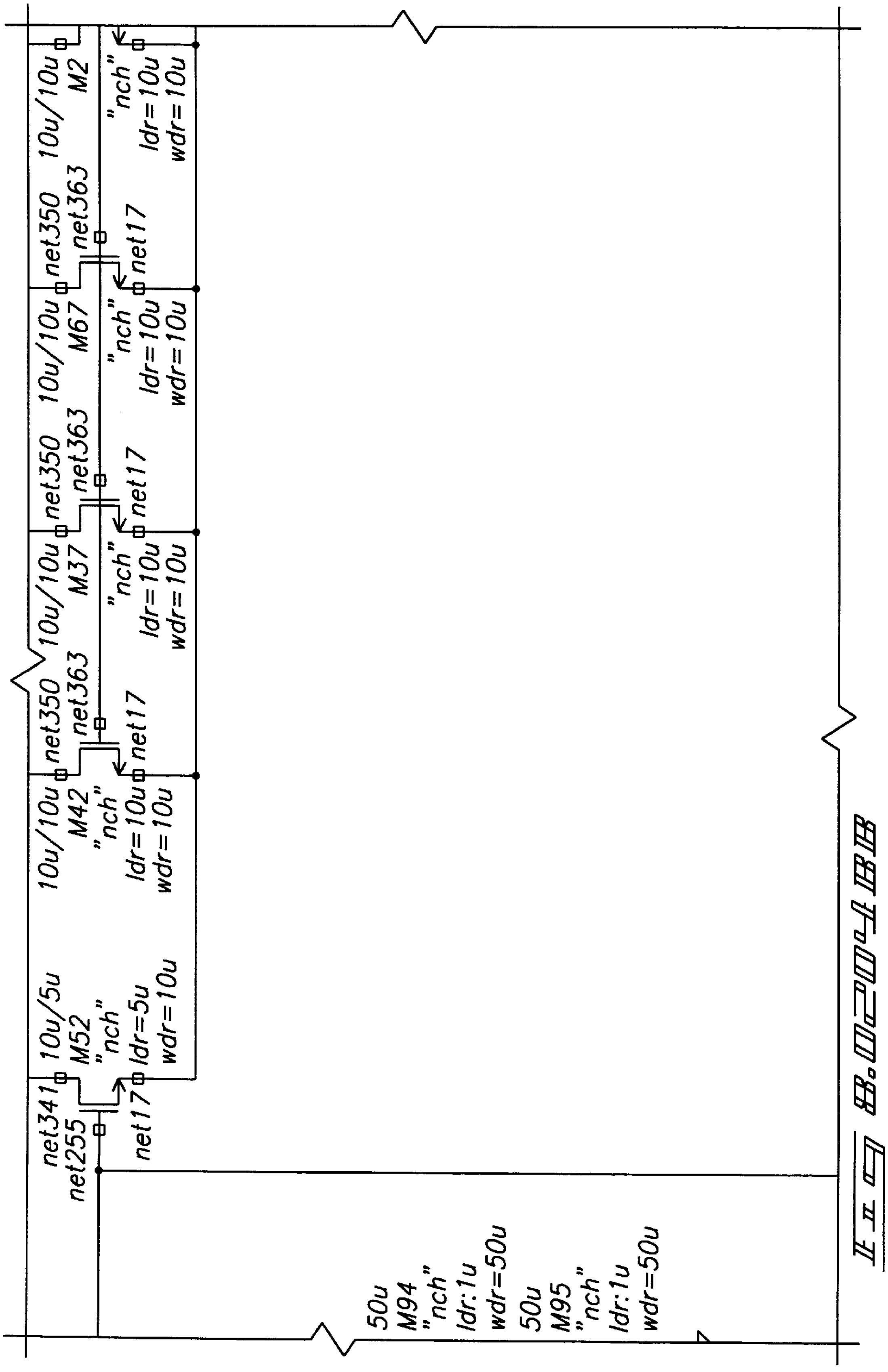
FIG. 8.0204BB

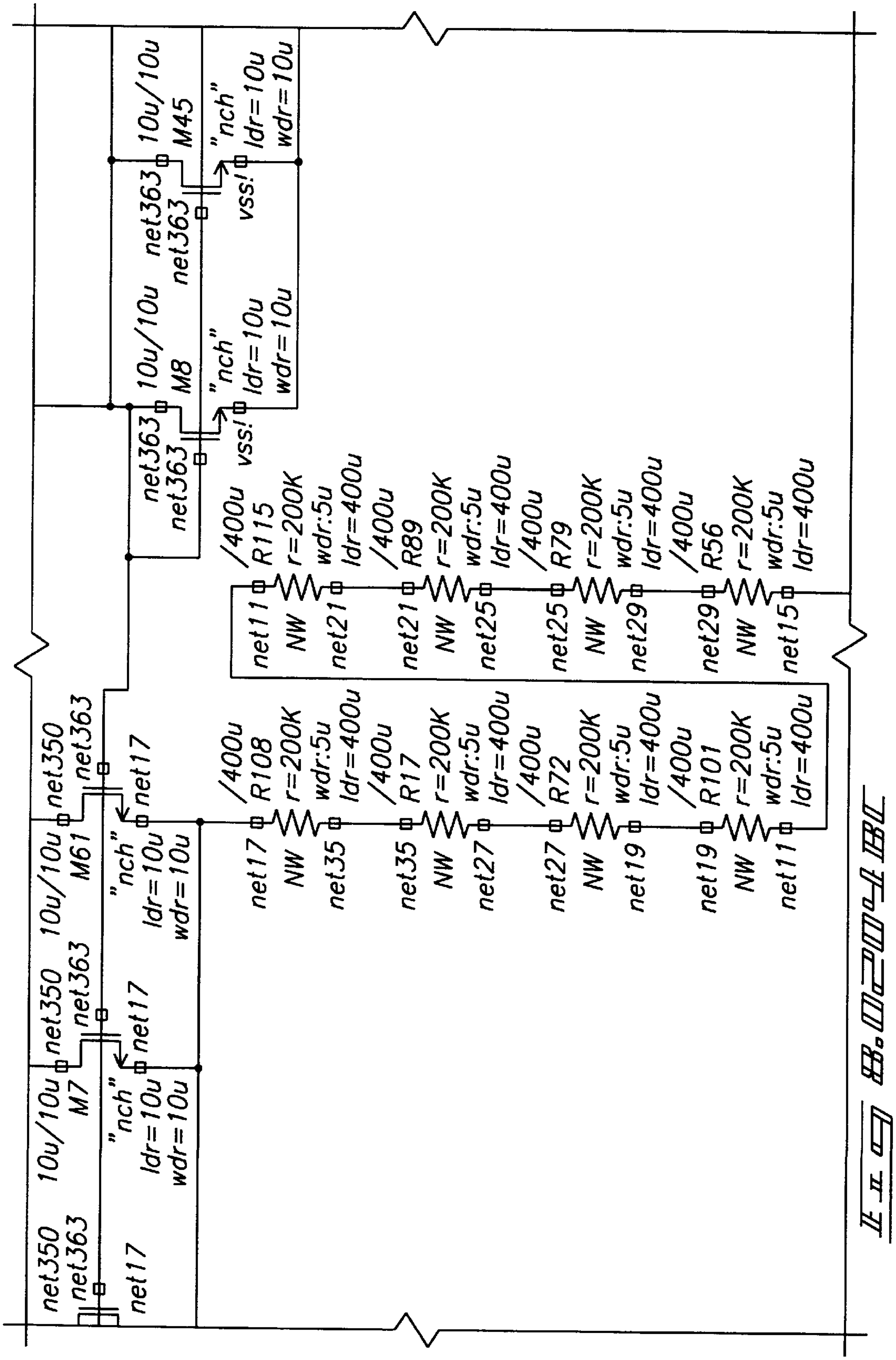
Fig. 8.0204BC

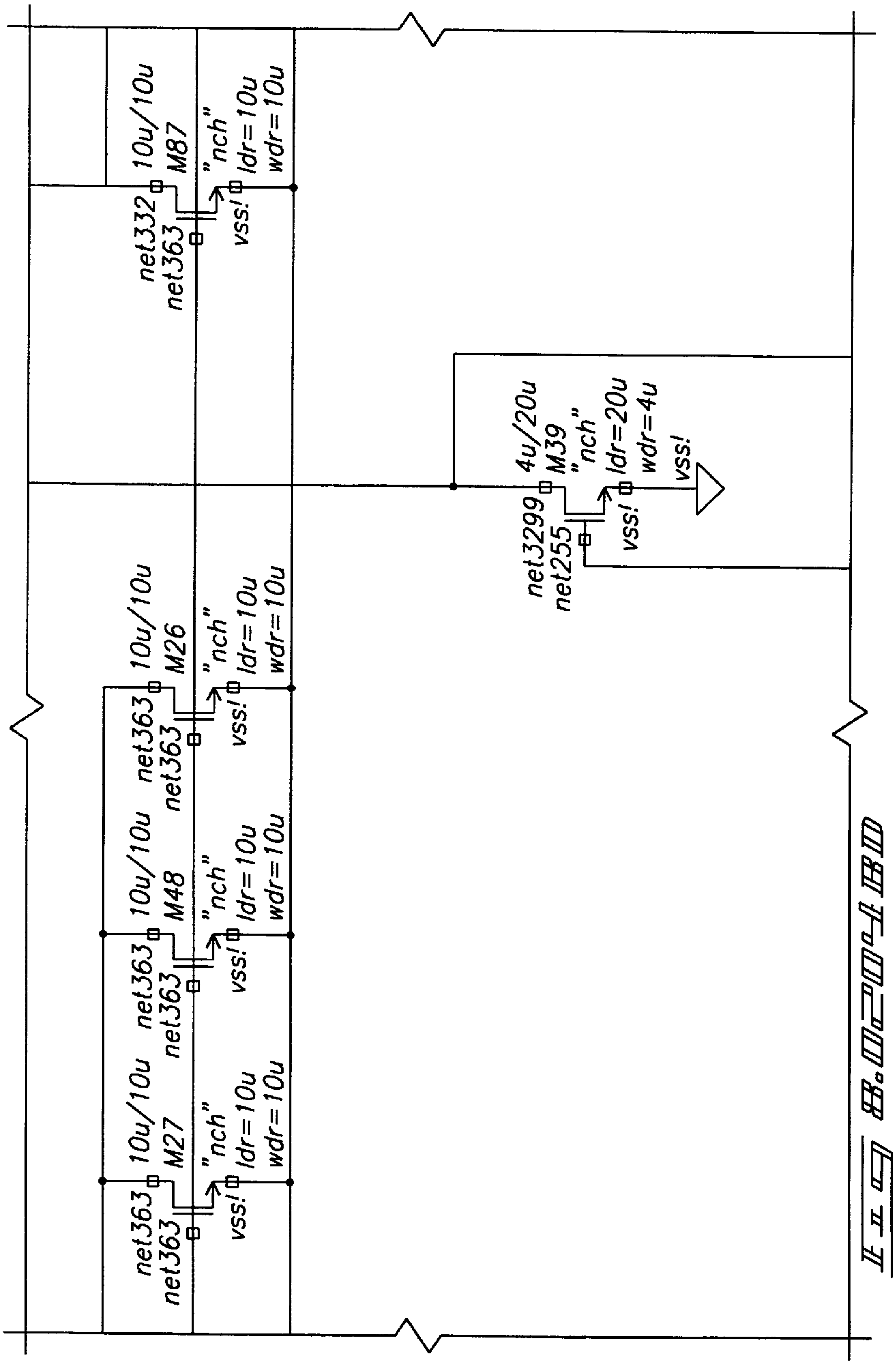
Fig. 8.204BD

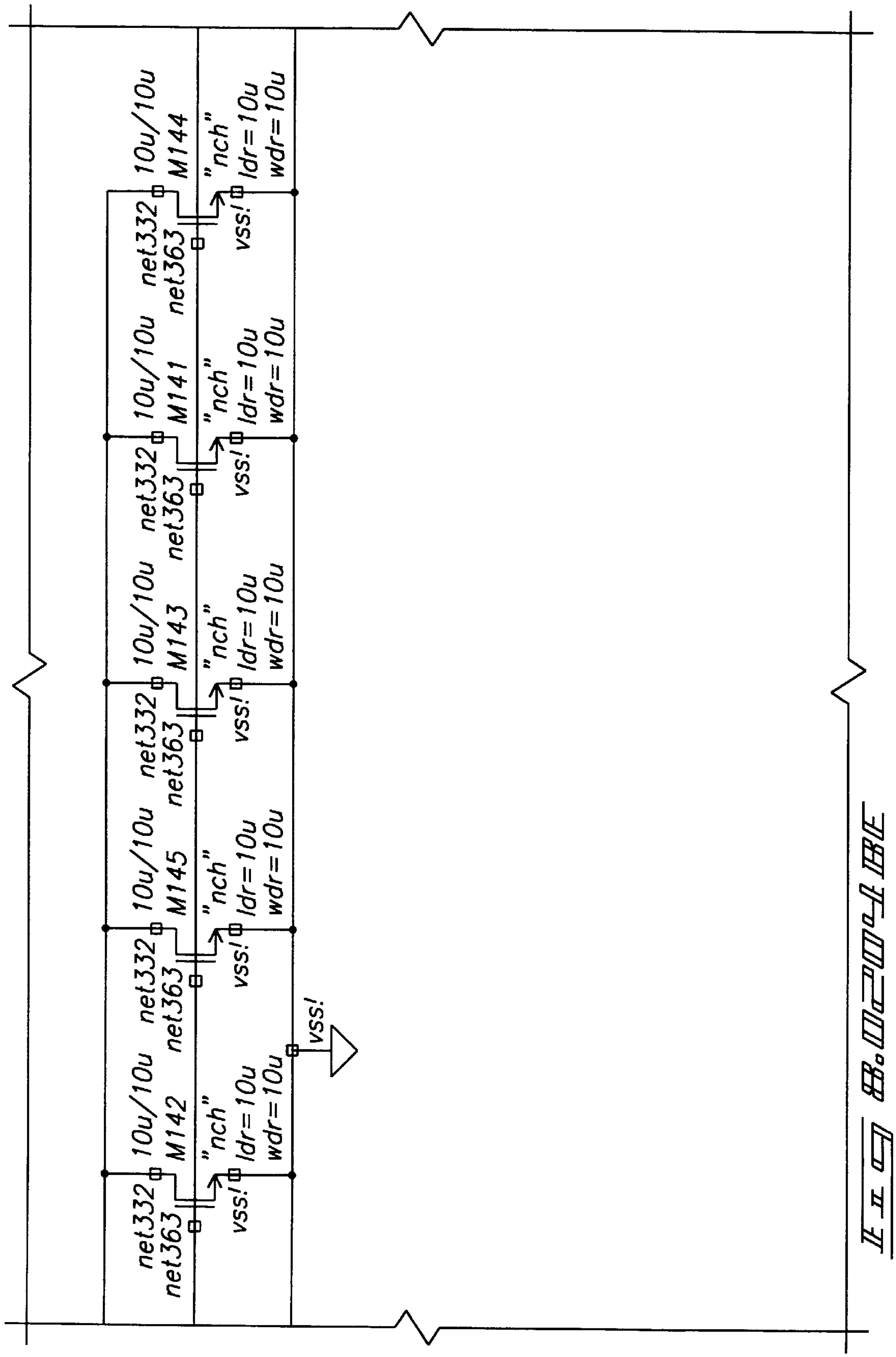
Fig. 8.0704BE

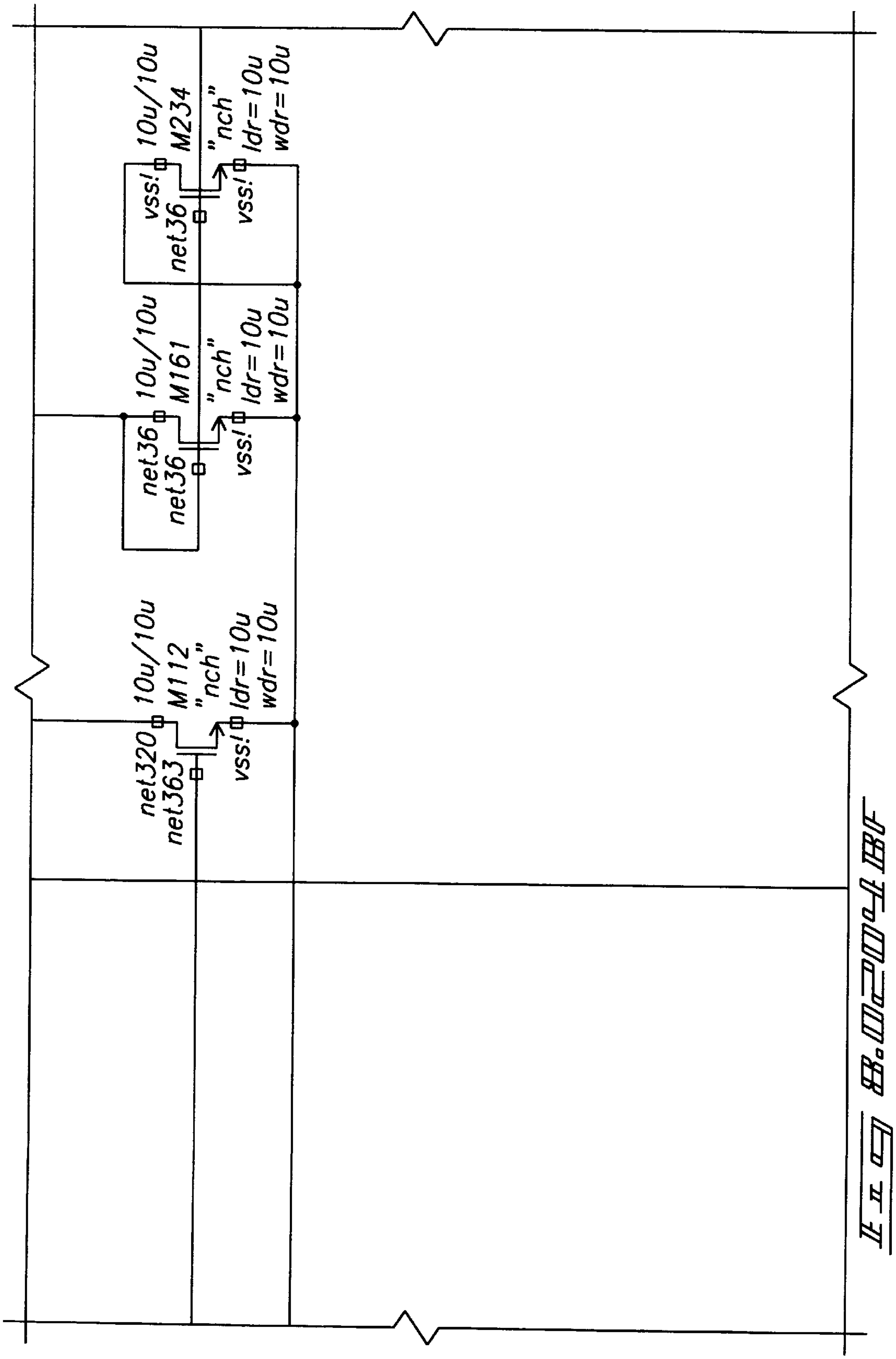
FIG. 8.0204BF

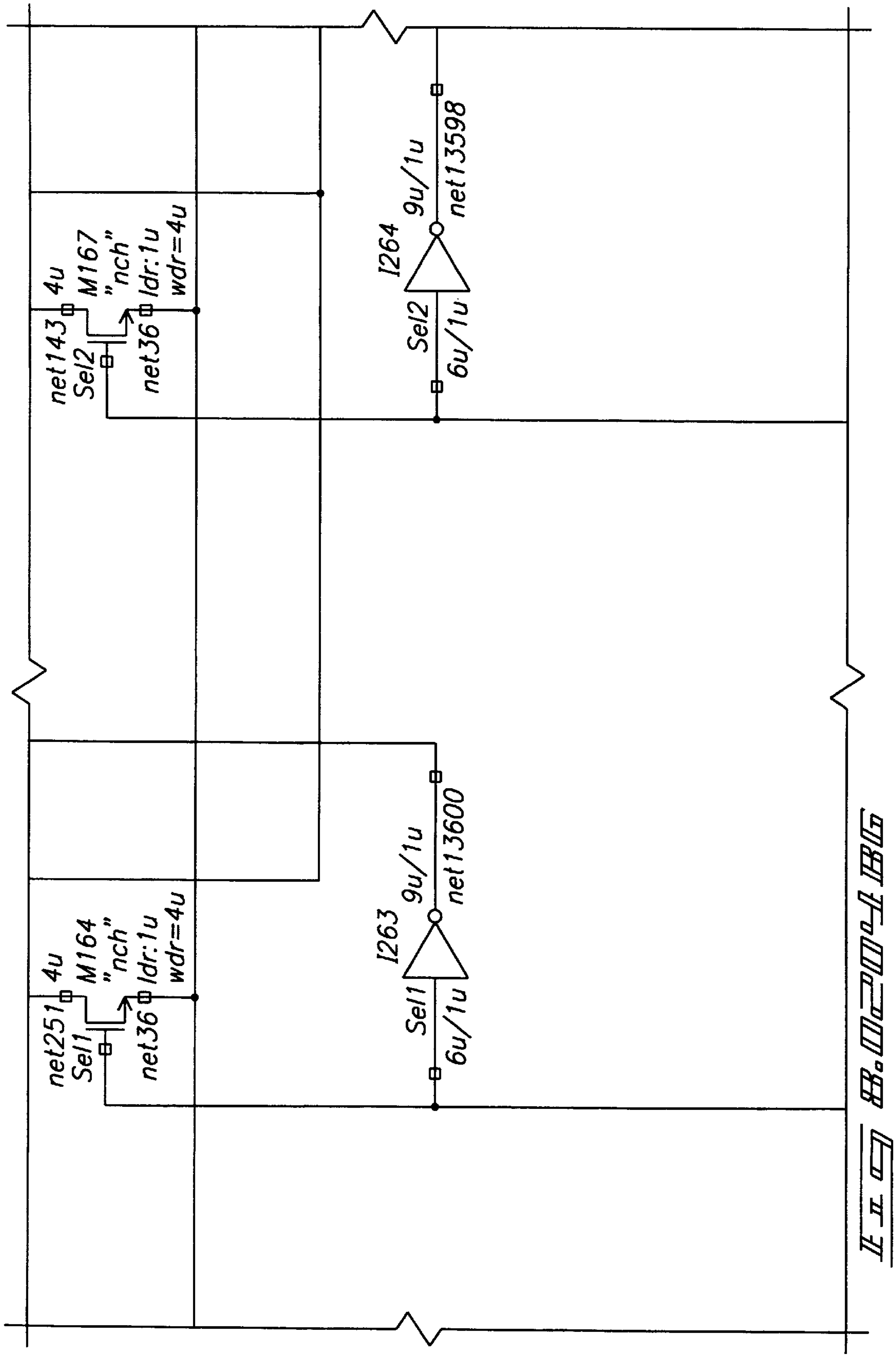
FIG. 8.0204BG

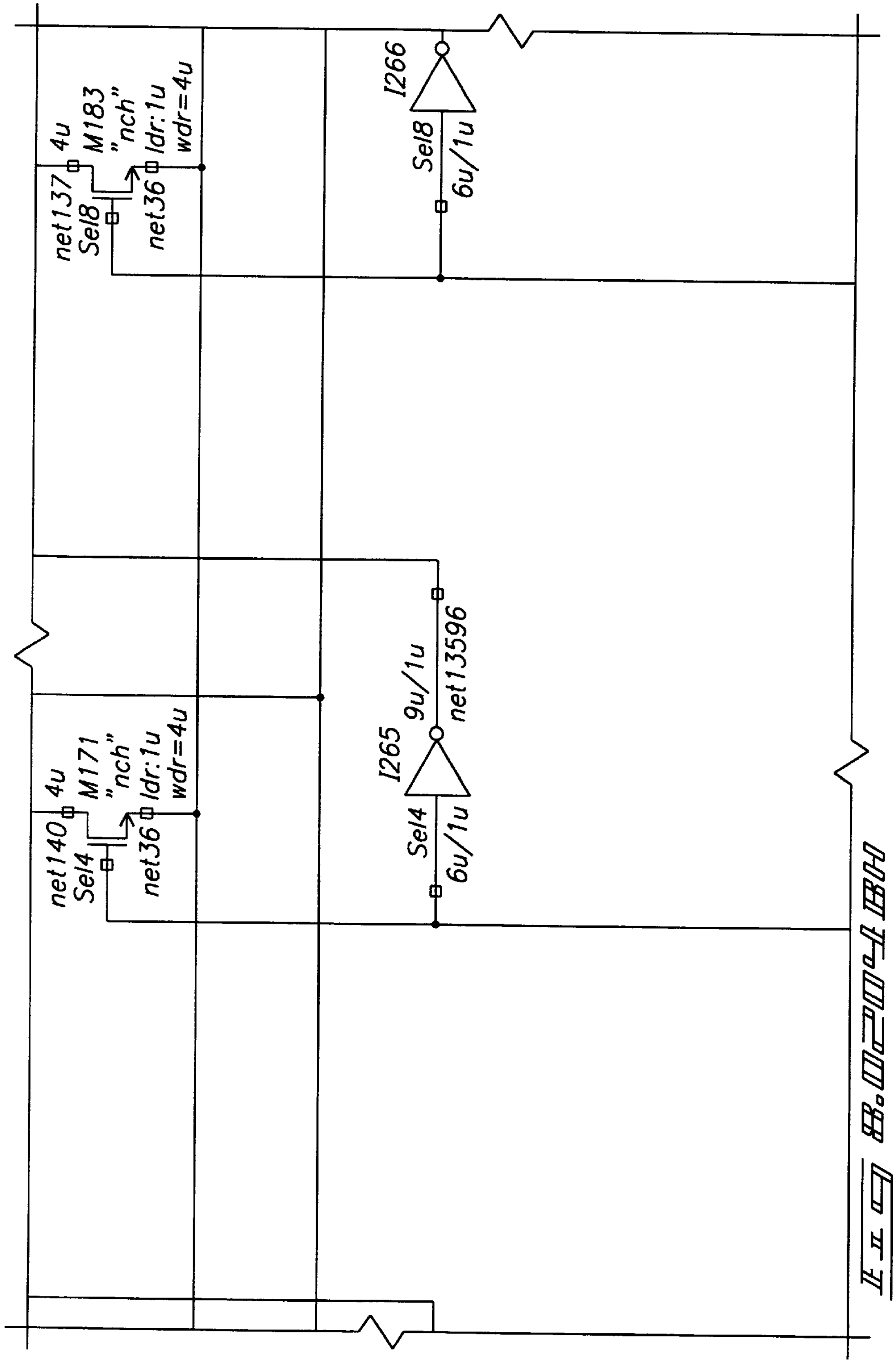
net137
Sel8
4u
M183
"nch"
ldr:1u
wdr=4u
net36
I266
Sel8
6u/1u
9u/1u
net13596
I265
net140
Sel4
4u
M171
"nch"
ldr:1u
wdr=4u
net36
Sel4
6u/1u

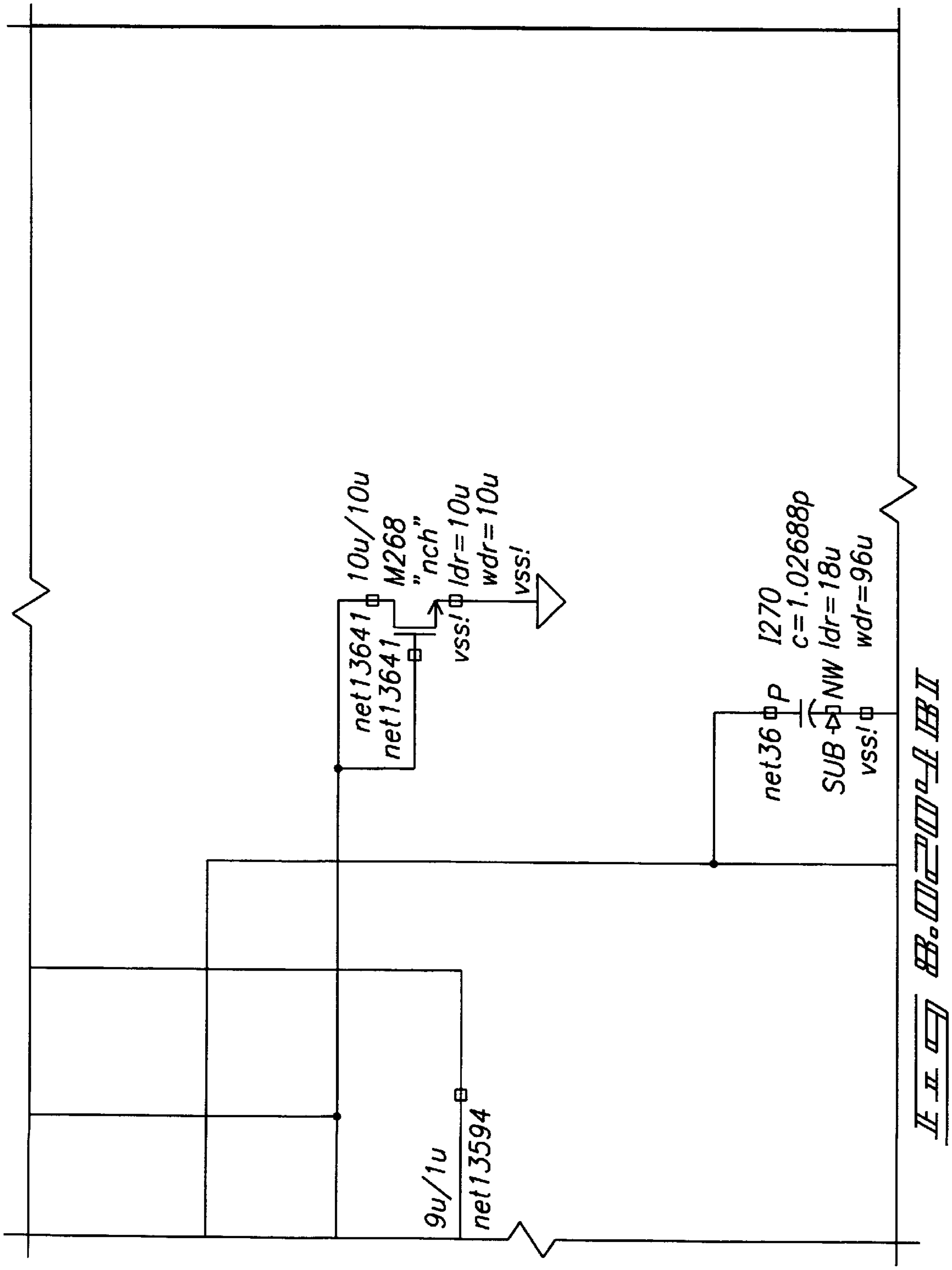
FIG. 8.20-HBII

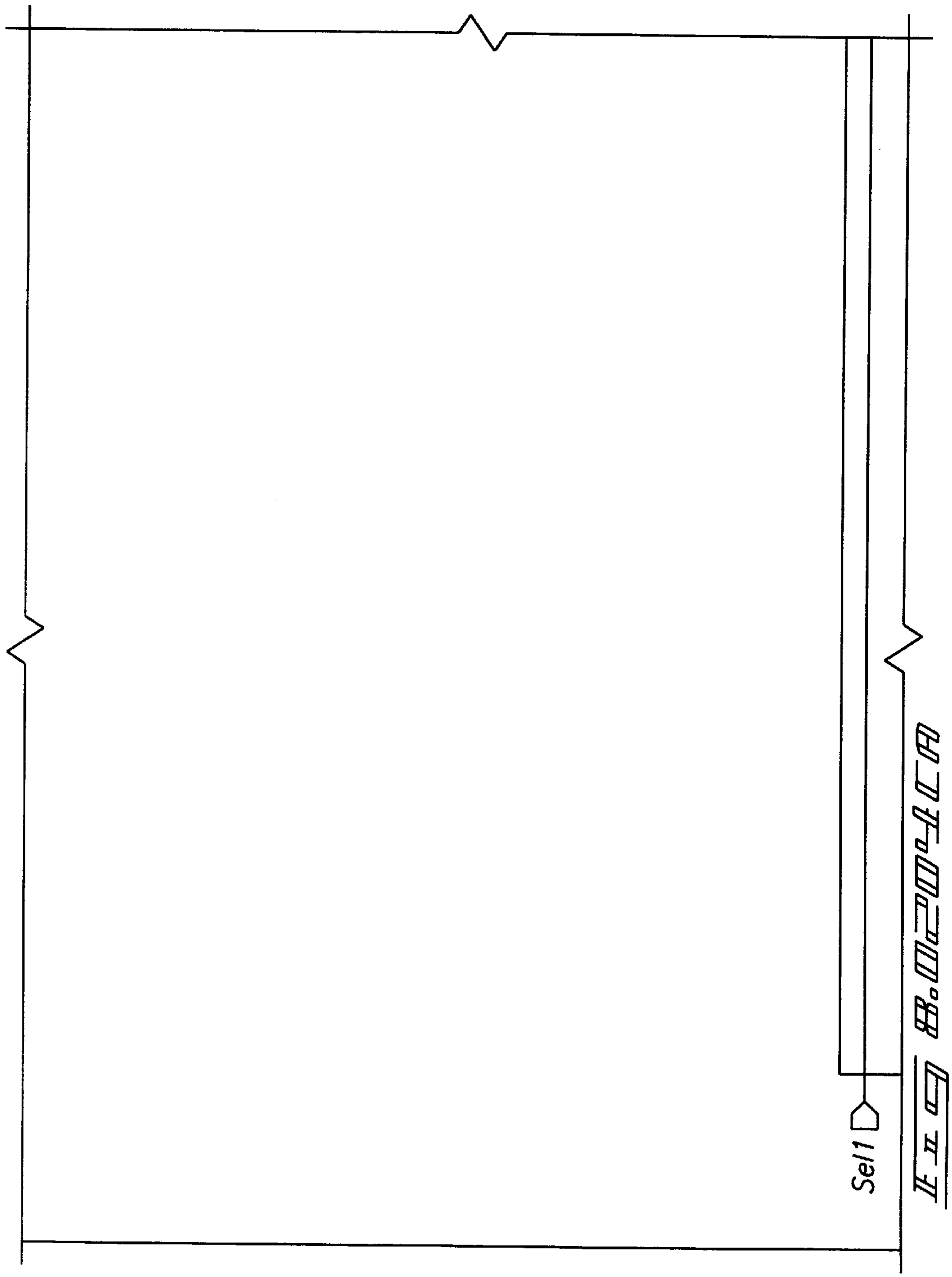
FIG. 8.020.4CA

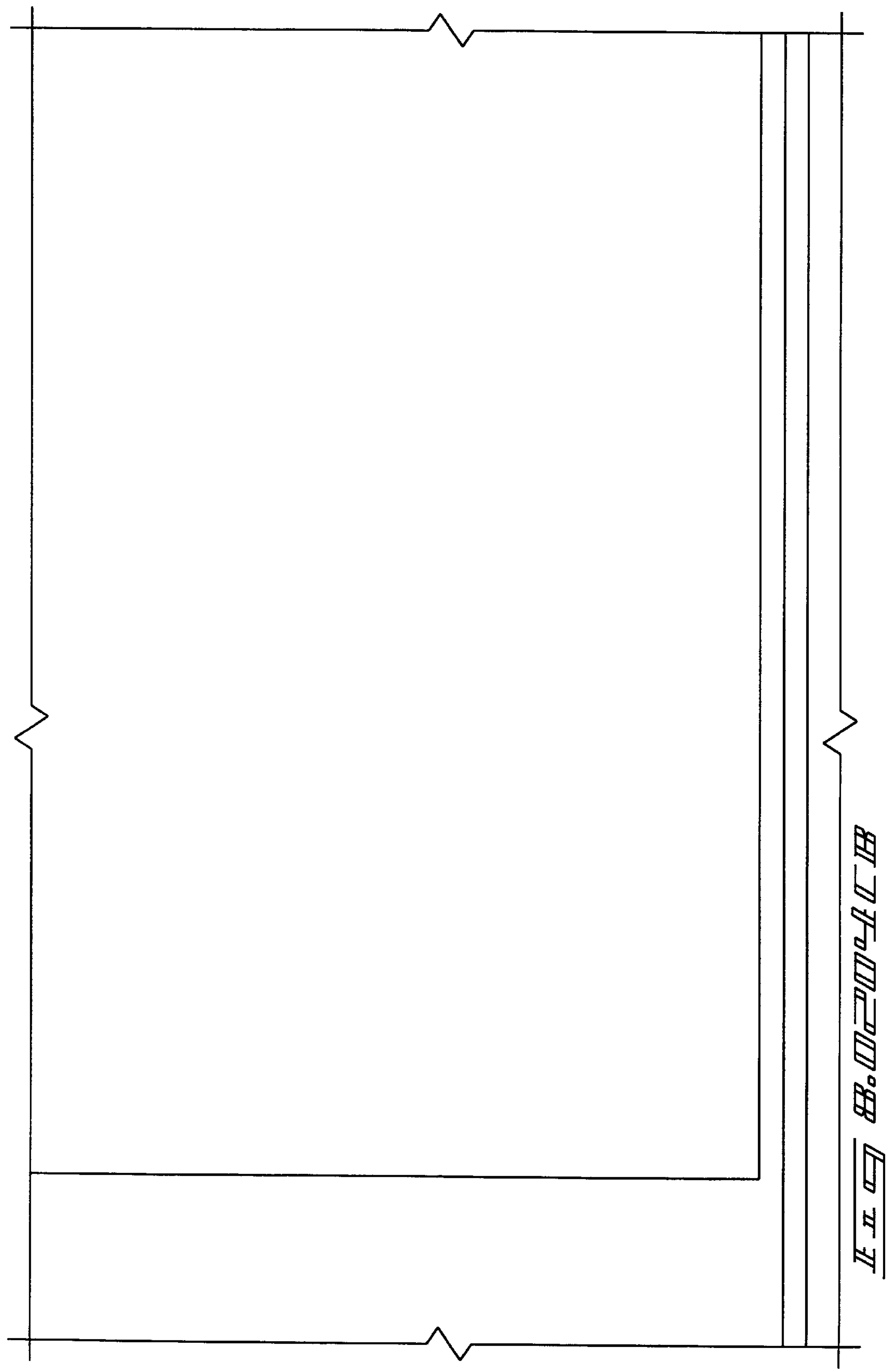
FIG. 8.0204CB

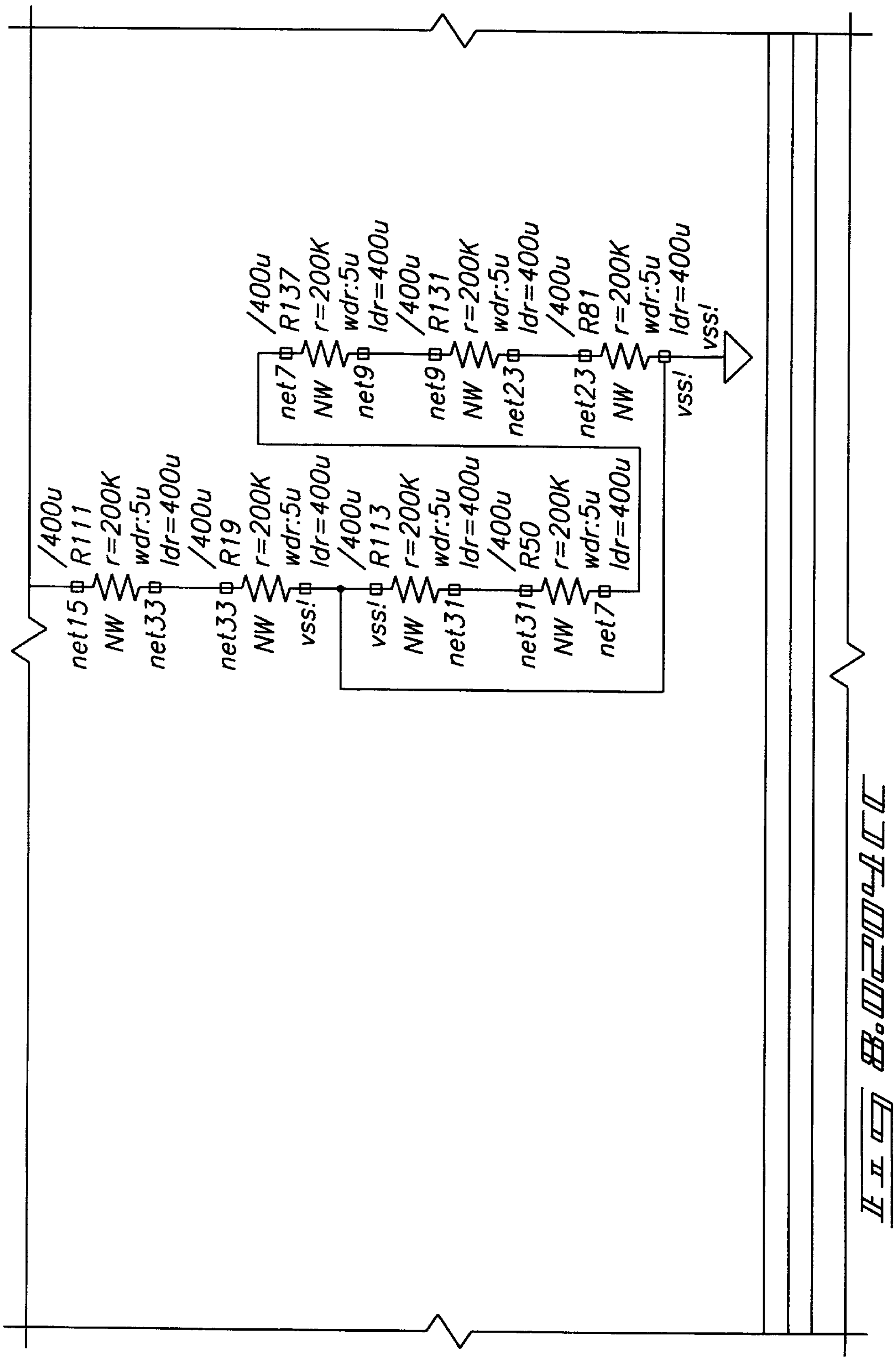
Fig. 8.0204CC

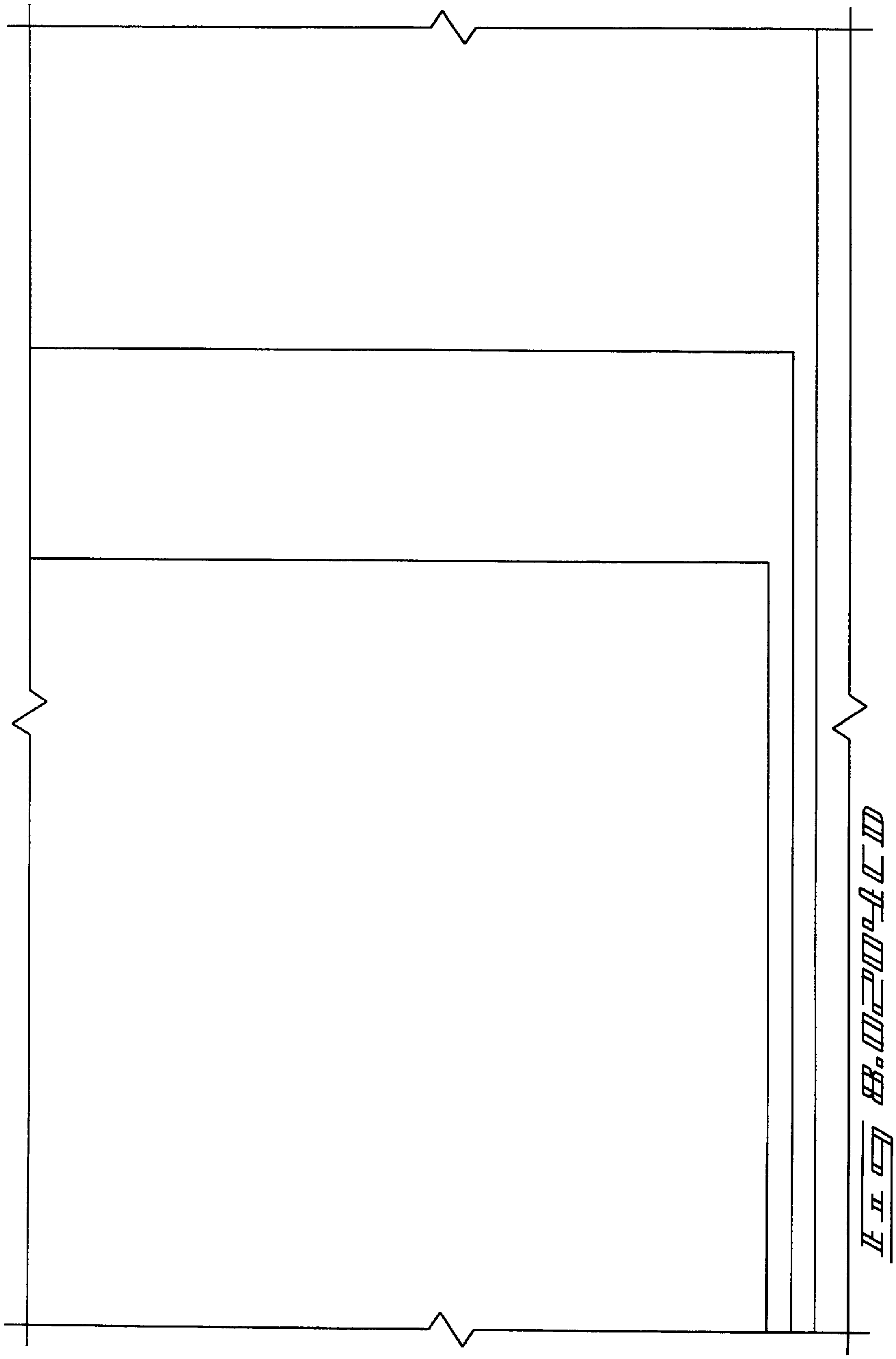
Fig 8.0204CD

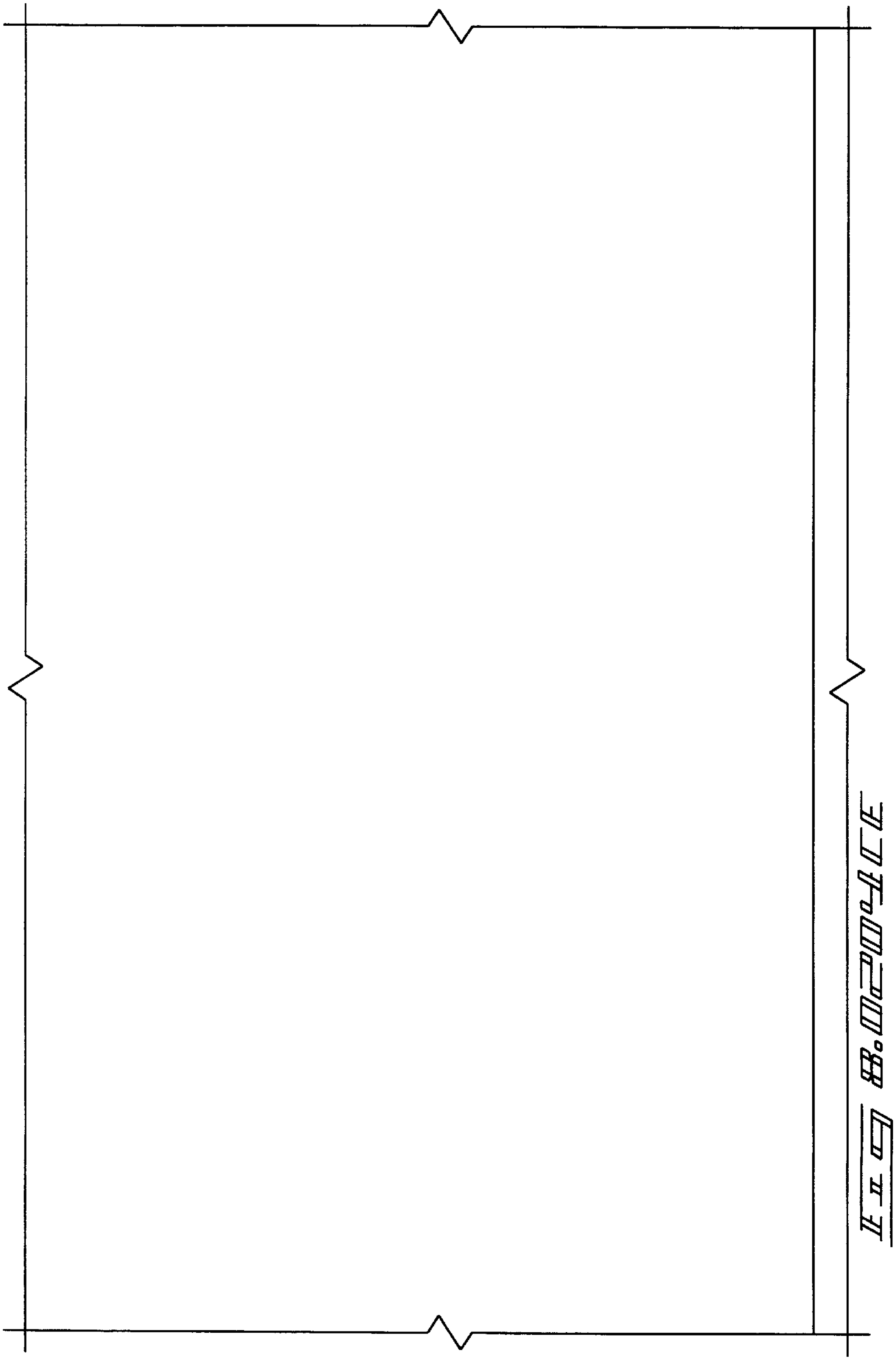
FIG. 8.020.4CE

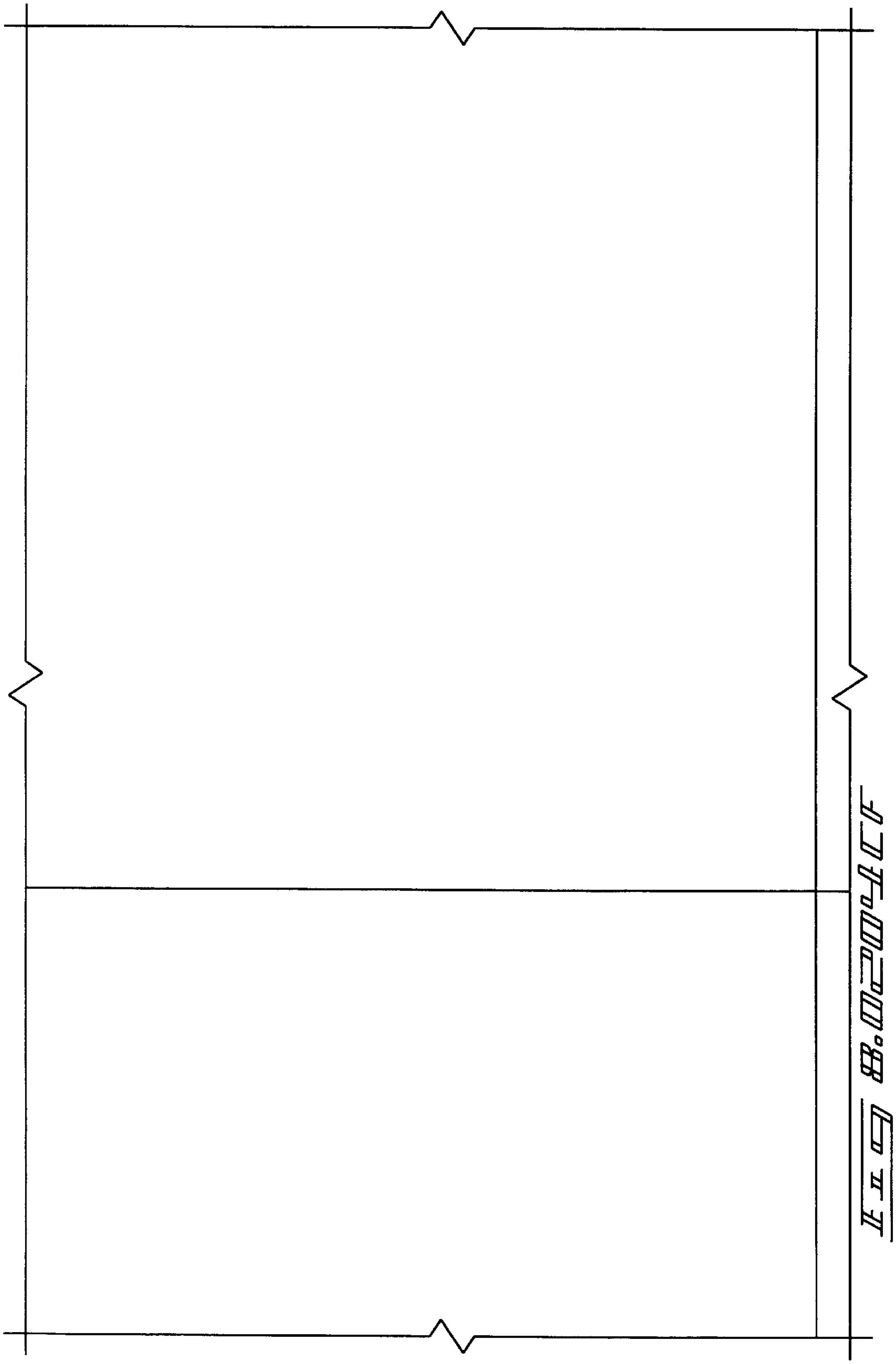
FIG. 8.020.4UF

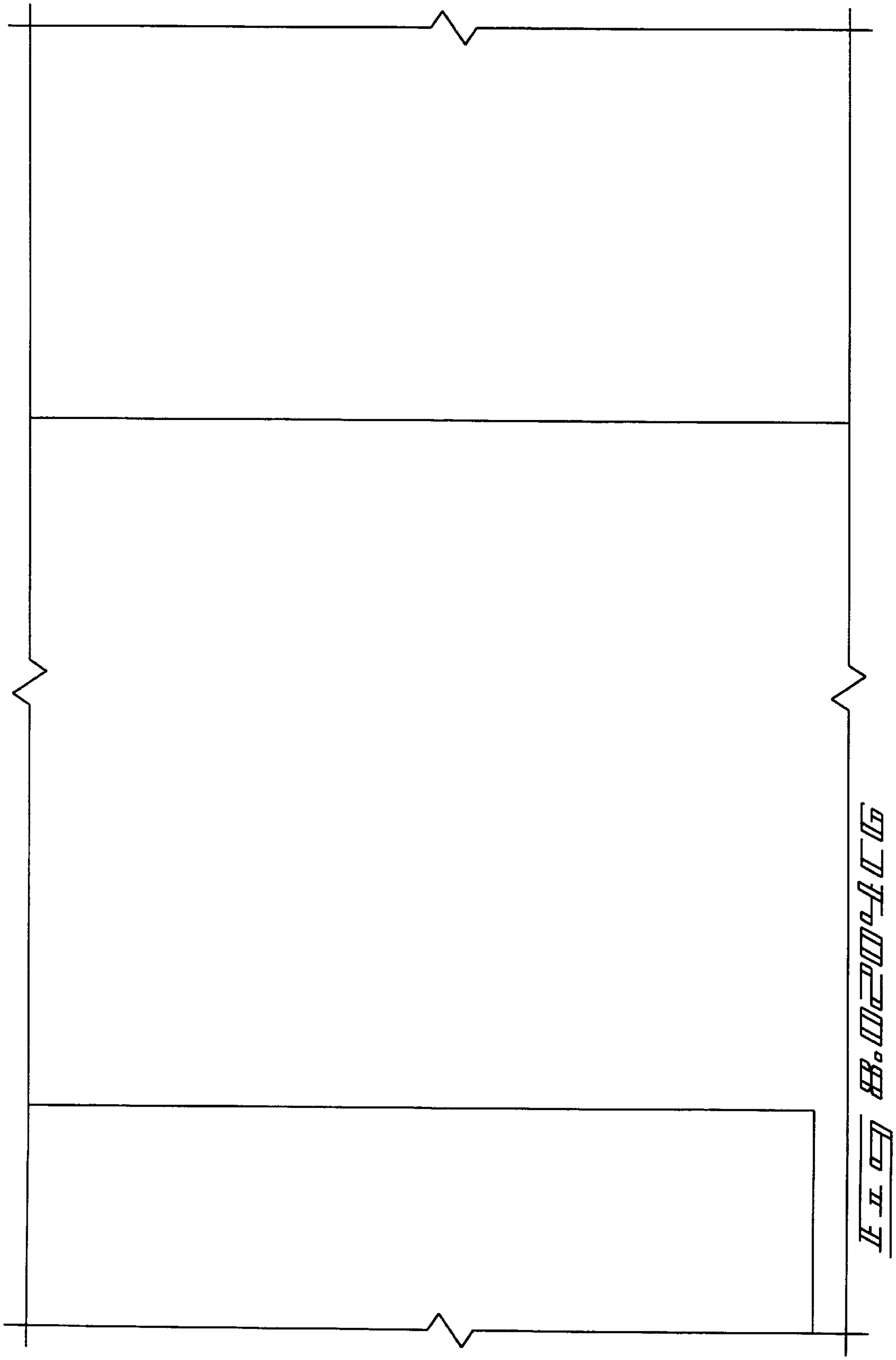
FIG. 8.0204C6

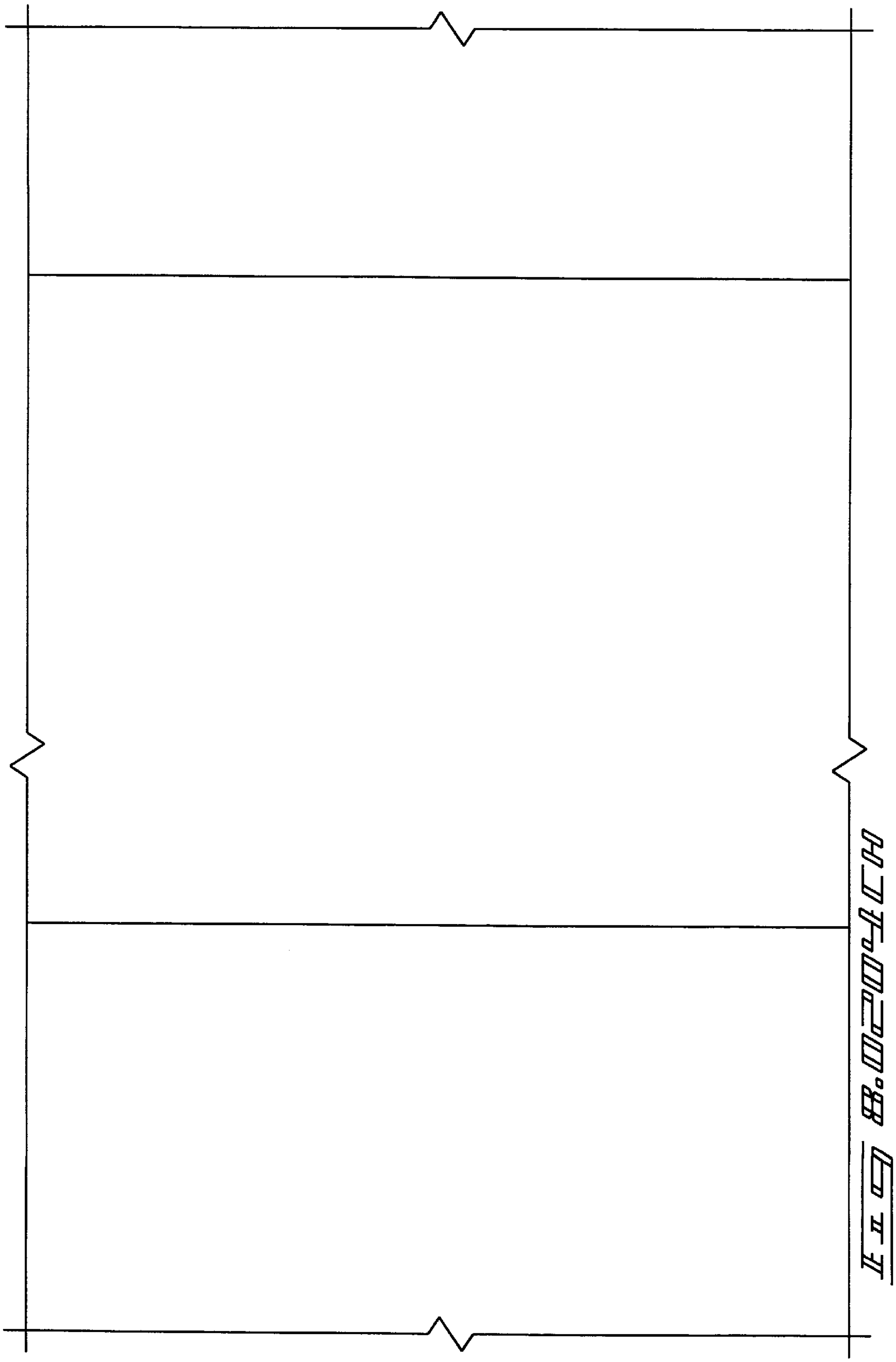
FIG. 8.0204CH

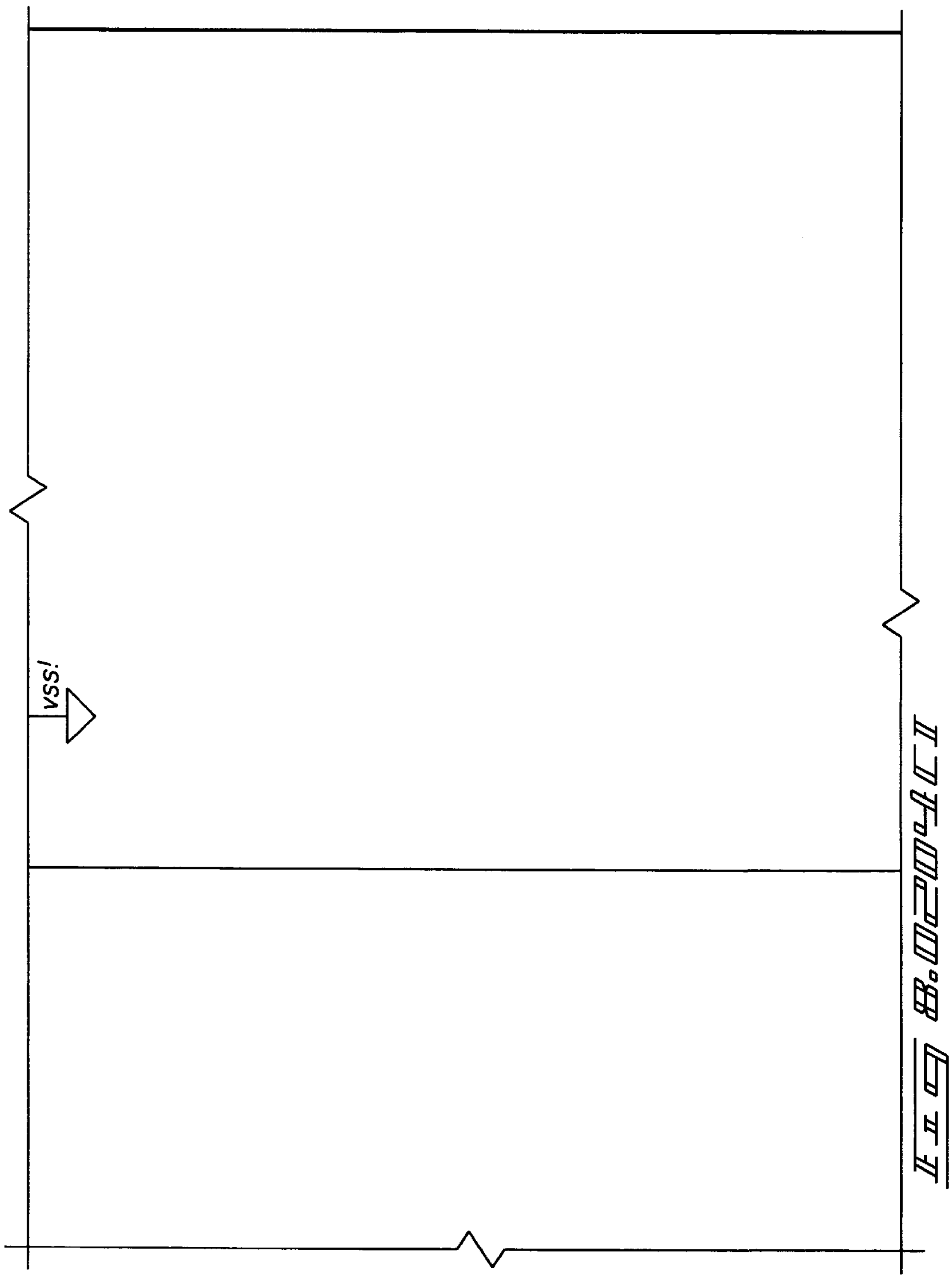
FIG. 8.0204C1

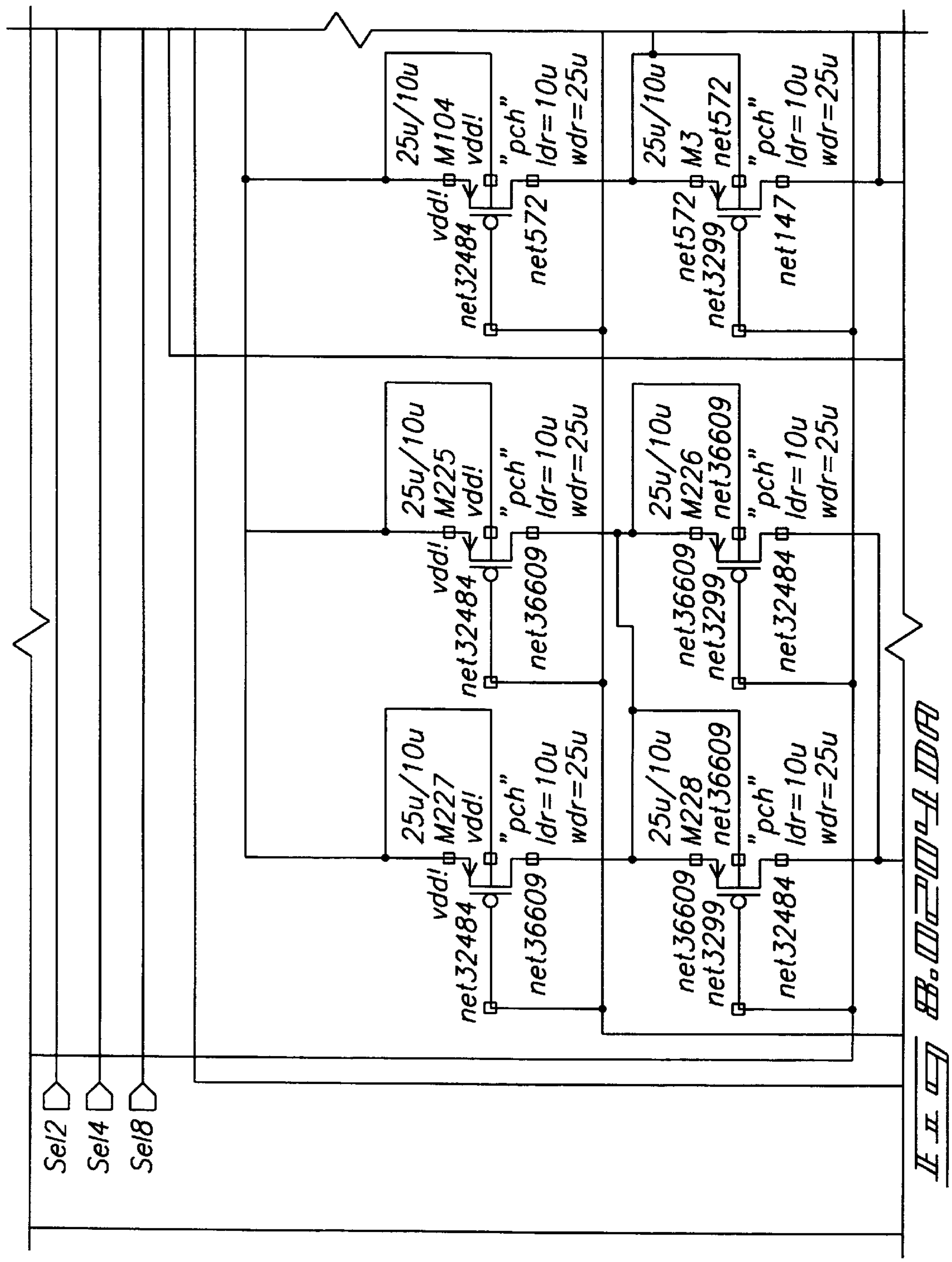
FIG. 8.0C04DA

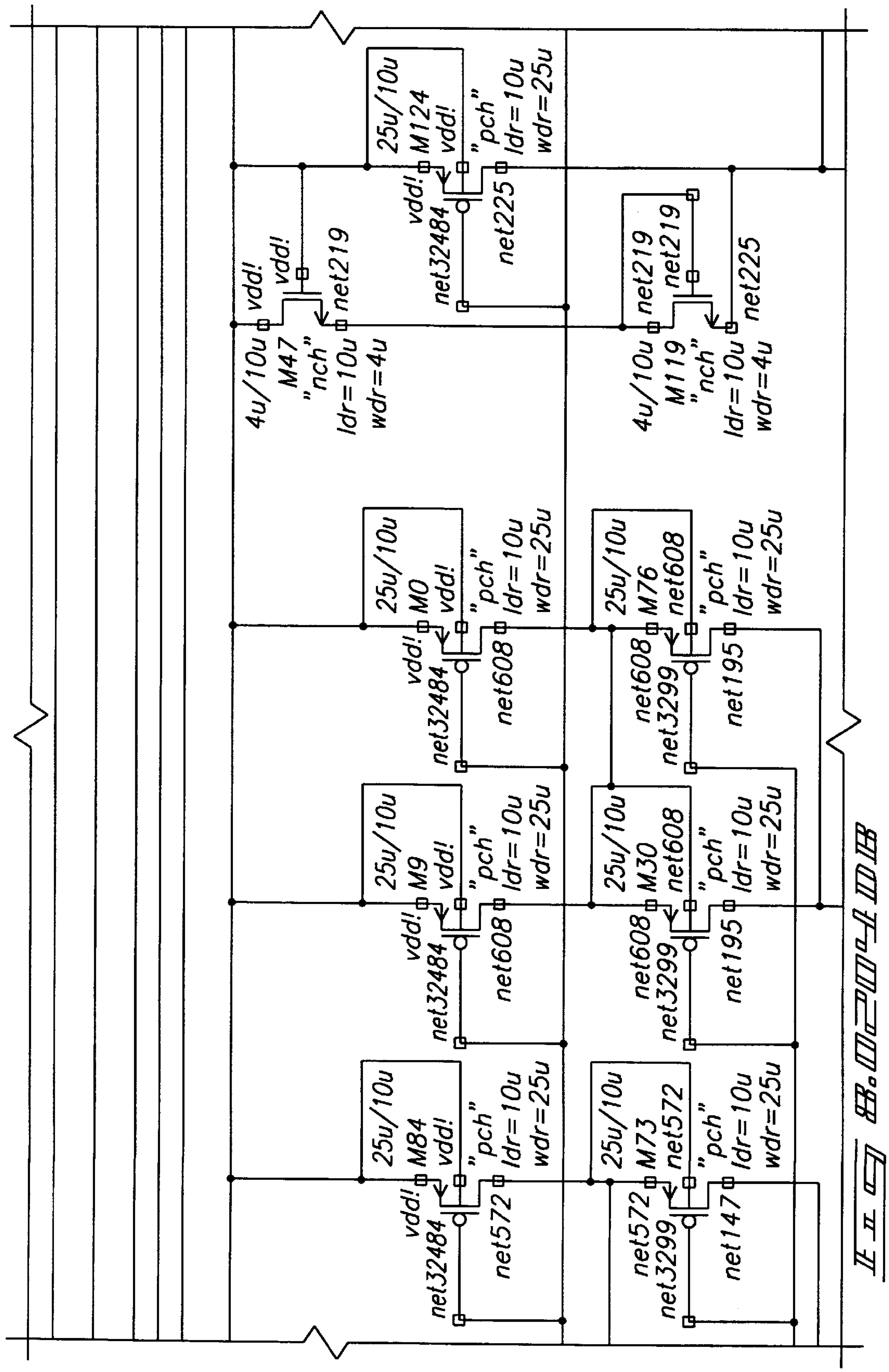
25u/10u
M124
vdd!
"pch"
ldr=10u
wdr=25u
vdd!
net32484
net225
vdd!
vdd!
net219
4u/10u
M47
"nch"
ldr=10u
wdr=4u
net219
net219
net225
4u/10u
M119
"nch"
ldr=10u
wdr=4u
25u/10u
M0
vdd!
"pch"
ldr=10u
wdr=25u
vdd!
net32484
net608
25u/10u
M76
net608
"pch"
ldr=10u
wdr=25u
net608
net3299
net195
25u/10u
M9
vdd!
"pch"
ldr=10u
wdr=25u
vdd!
net32484
net608
25u/10u
M30
net608
"pch"
ldr=10u
wdr=25u
net608
net3299
net195
25u/10u
M84
vdd!
"pch"
ldr=10u
wdr=25u
vdd!
net32484
net572
25u/10u
M73
net572
"pch"
ldr=10u
wdr=25u
net572
net3299
net147

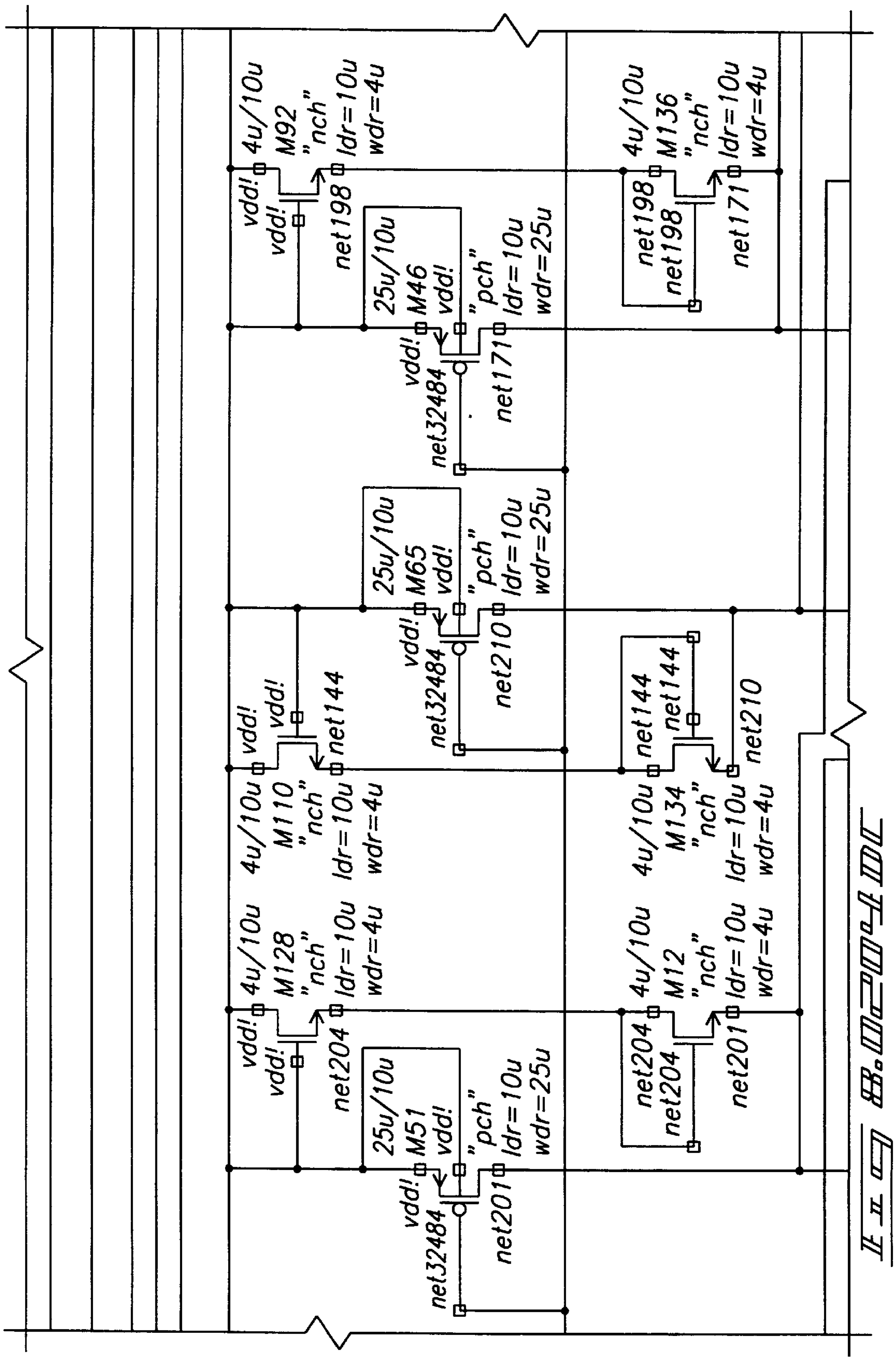
4u/10u
M92
"nch"
ldr=10u
wdr=4u
vdd!
vdd!
net198
25u/10u
M46
vdd!
"pch"
ldr=10u
wdr=25u
vdd!
net32484
net171
4u/10u
M136
"nch"
ldr=10u
wdr=4u
net198
net198
net171
25u/10u
M65
vdd!
"pch"
ldr=10u
wdr=25u
vdd!
net32484
net210
vdd!
vdd!
net144
4u/10u
M110
"nch"
ldr=10u
wdr=4u
net144
net144
net210
4u/10u
M134
"nch"
ldr=10u
wdr=4u
4u/10u
M128
"nch"
ldr=10u
wdr=4u
vdd!
vdd!
net204
25u/10u
M51
vdd!
"pch"
ldr=10u
wdr=25u
vdd!
net32484
net201
4u/10u
M12
"nch"
ldr=10u
wdr=4u
net204
net204
net201

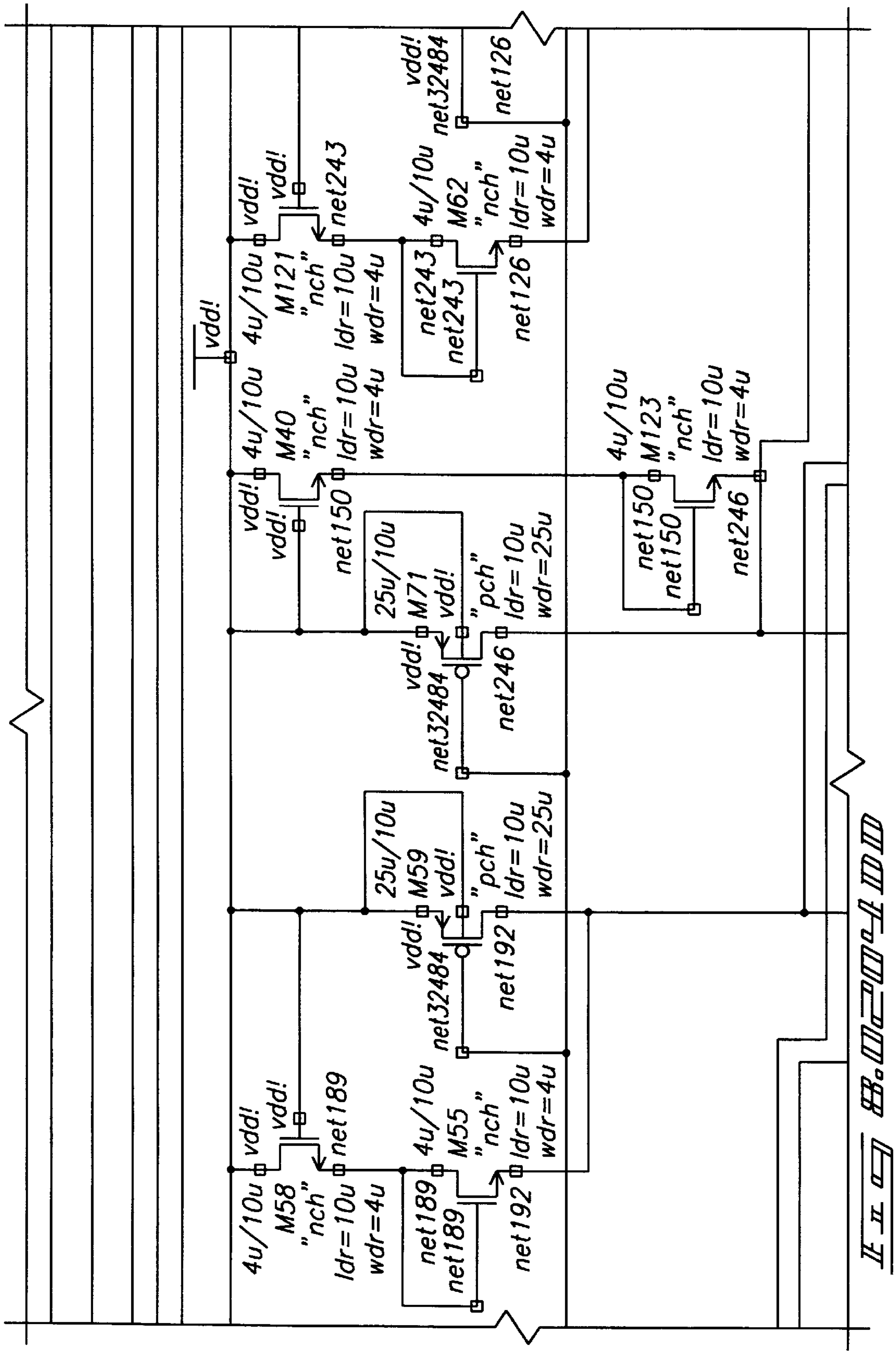
FIG. 8.0204D

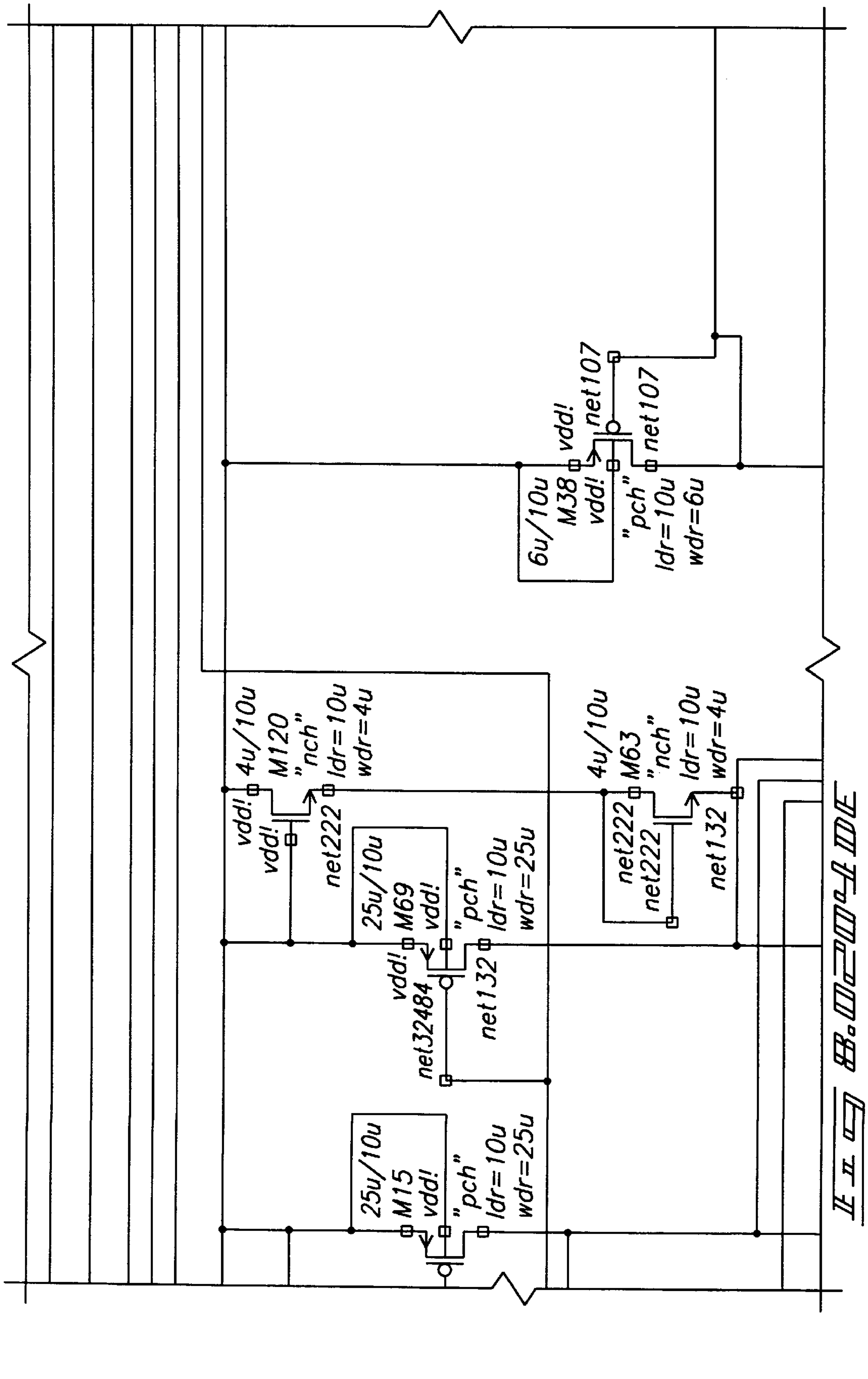
FIG. 8.0204DE

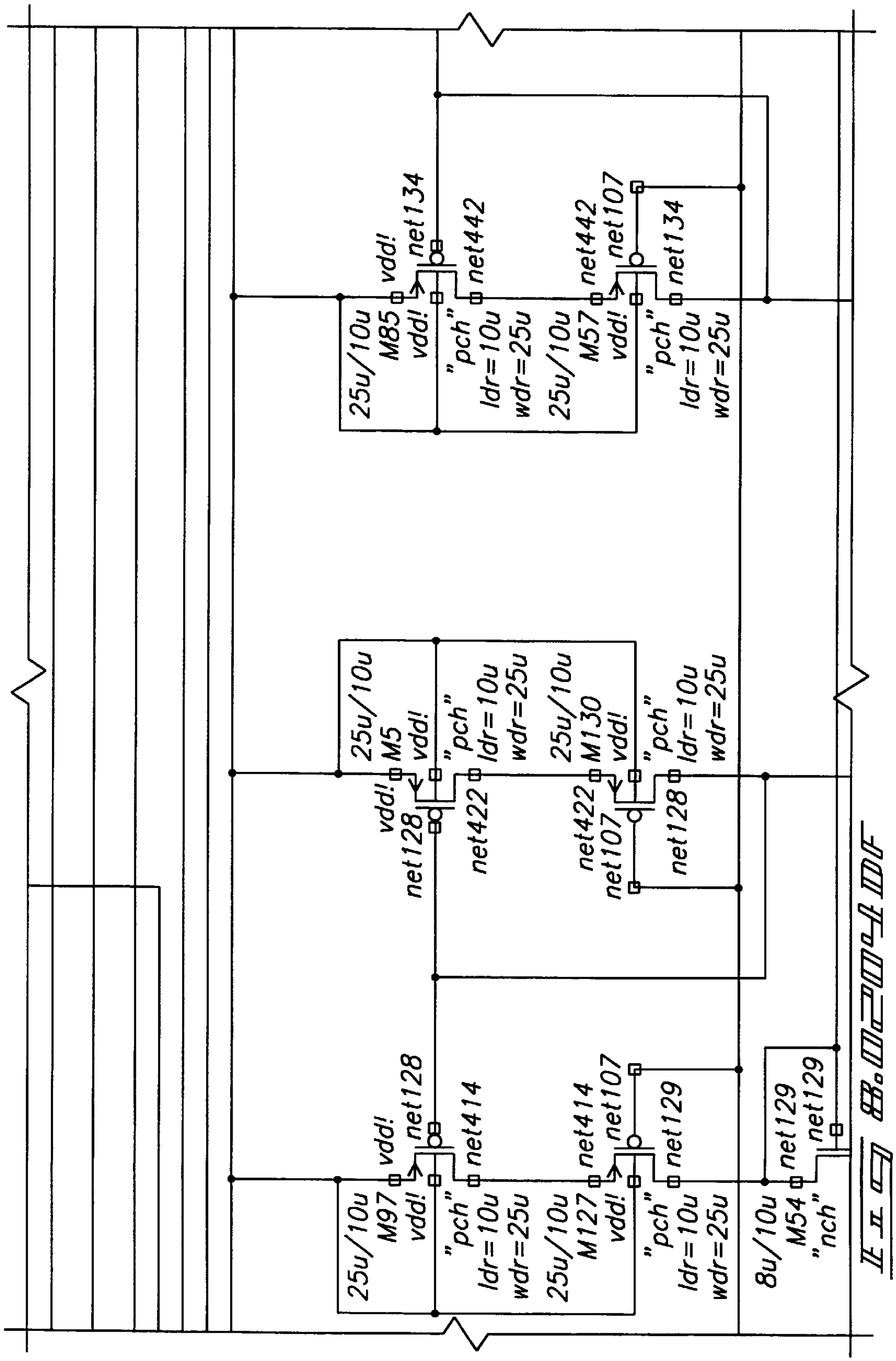
FIG. 8.0204DF

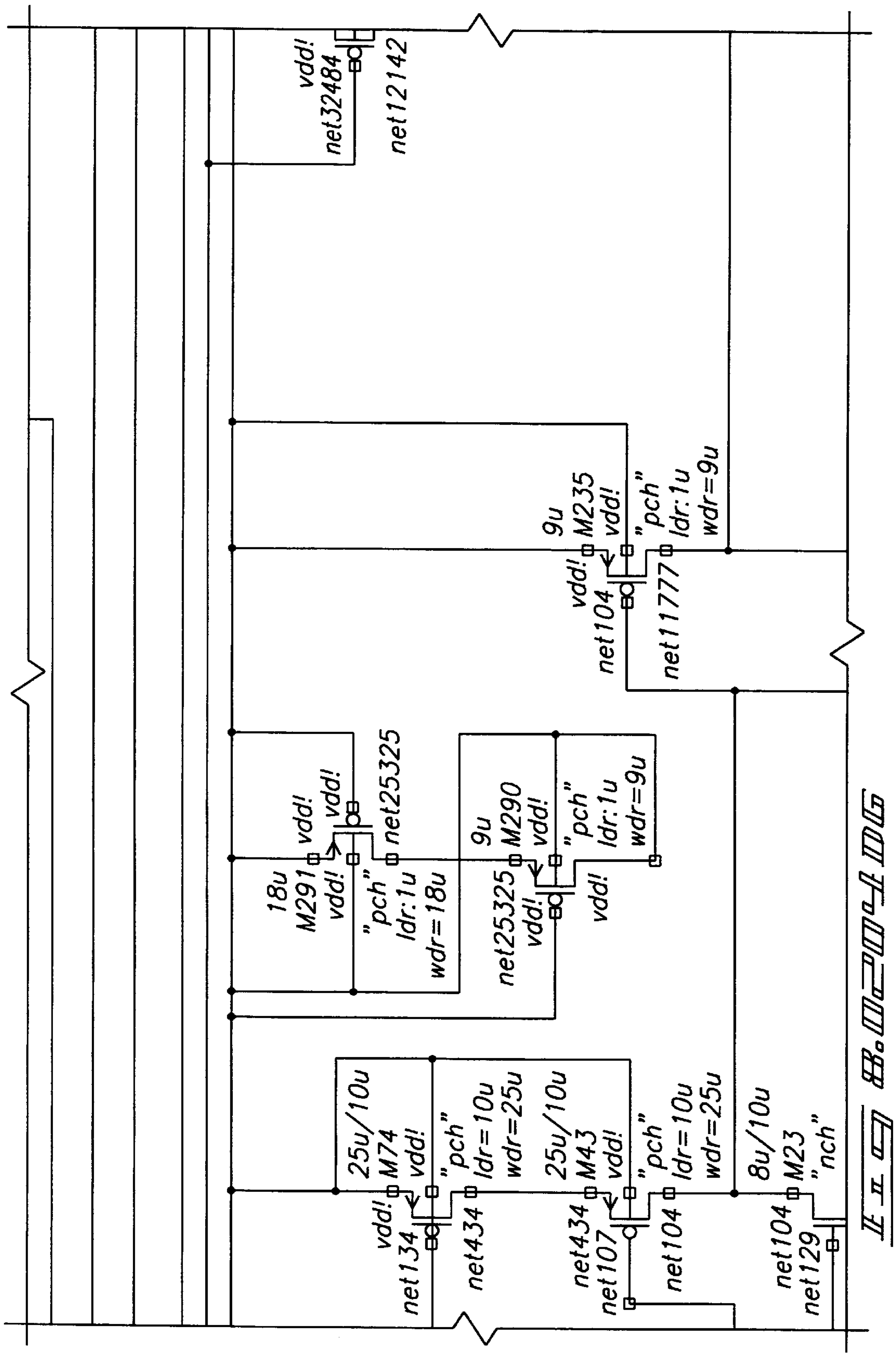
Fig 8.0204DG

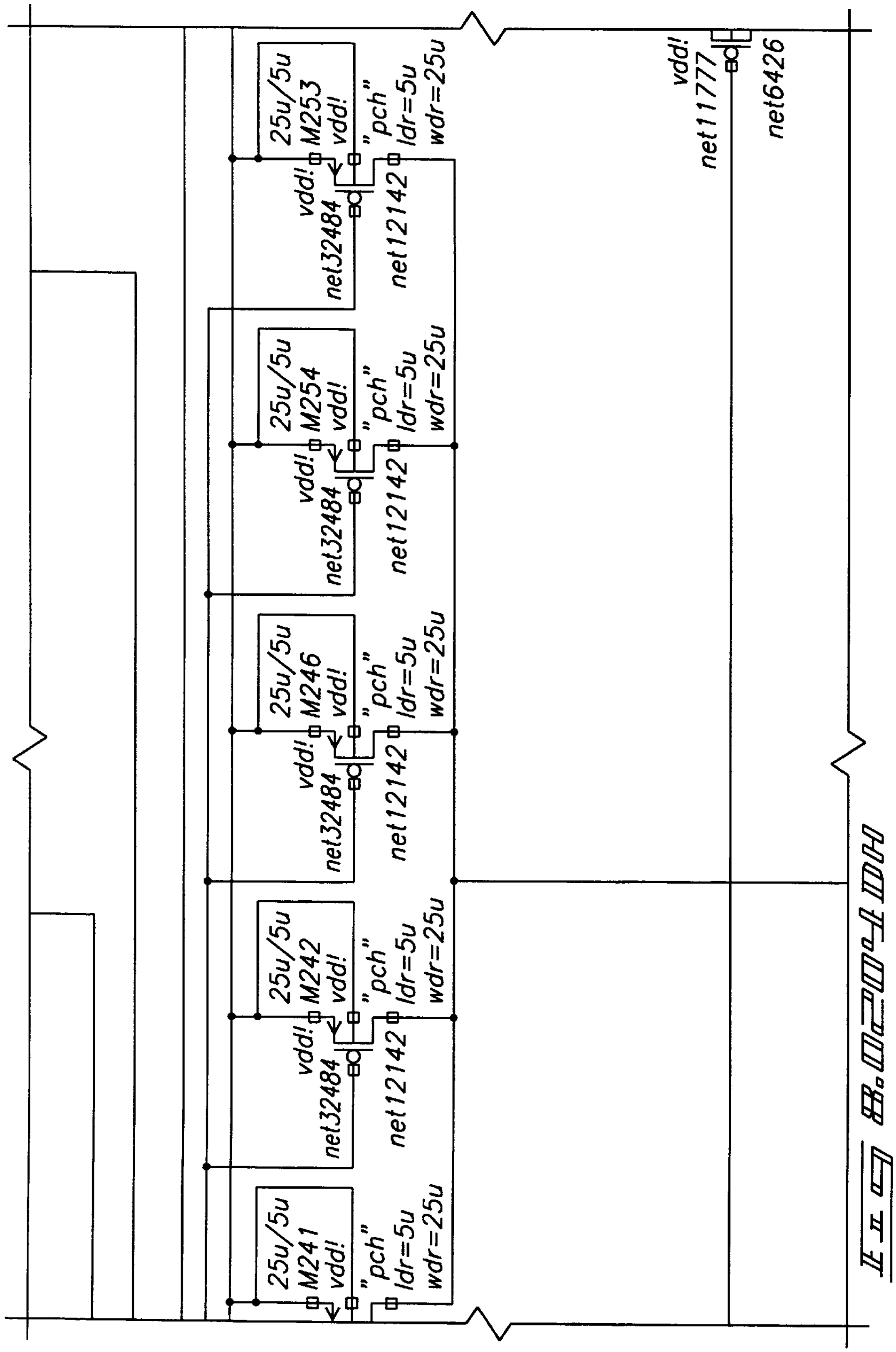
FIG. 8.207DH

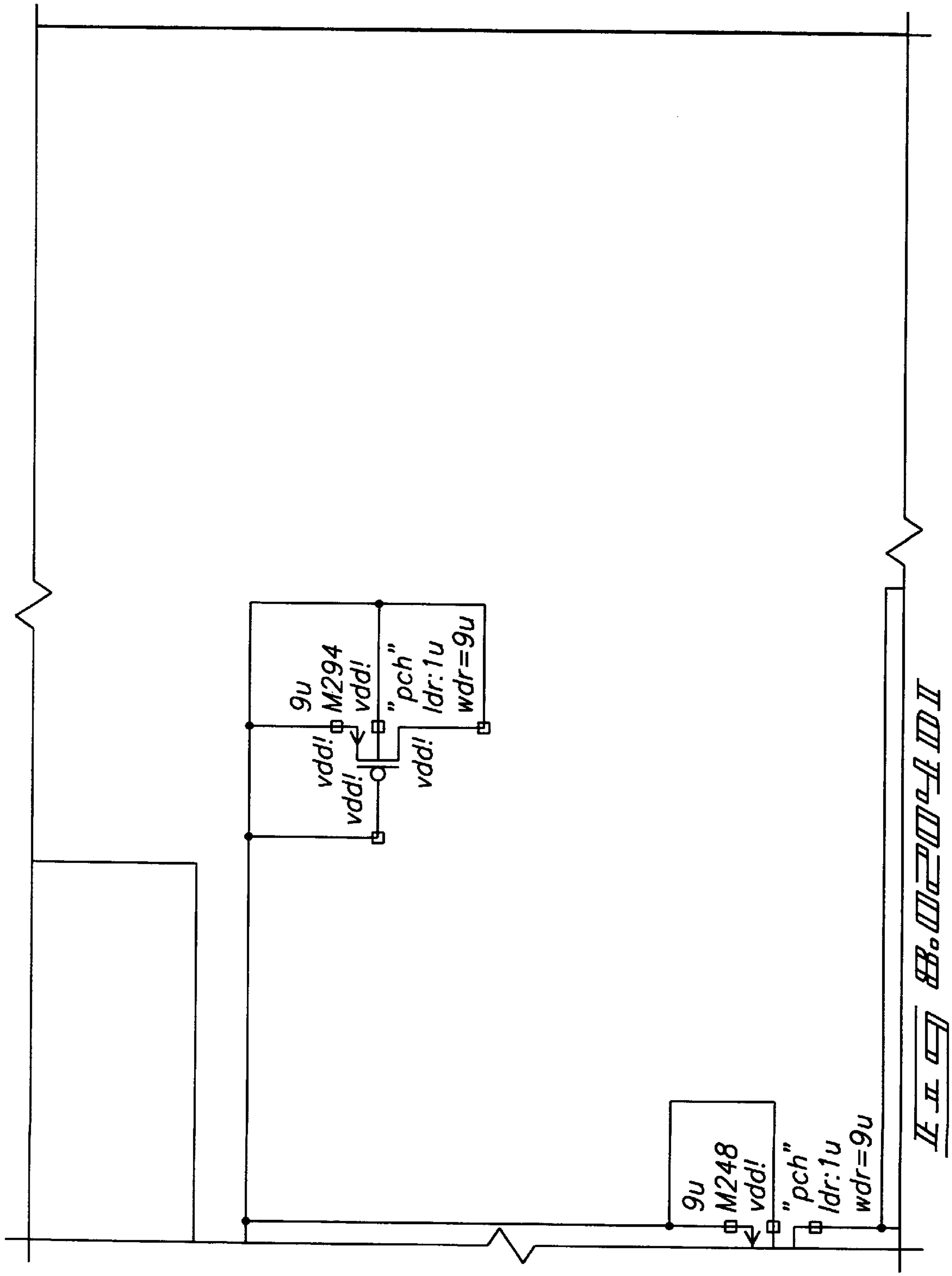
Fig. 8.00204D II

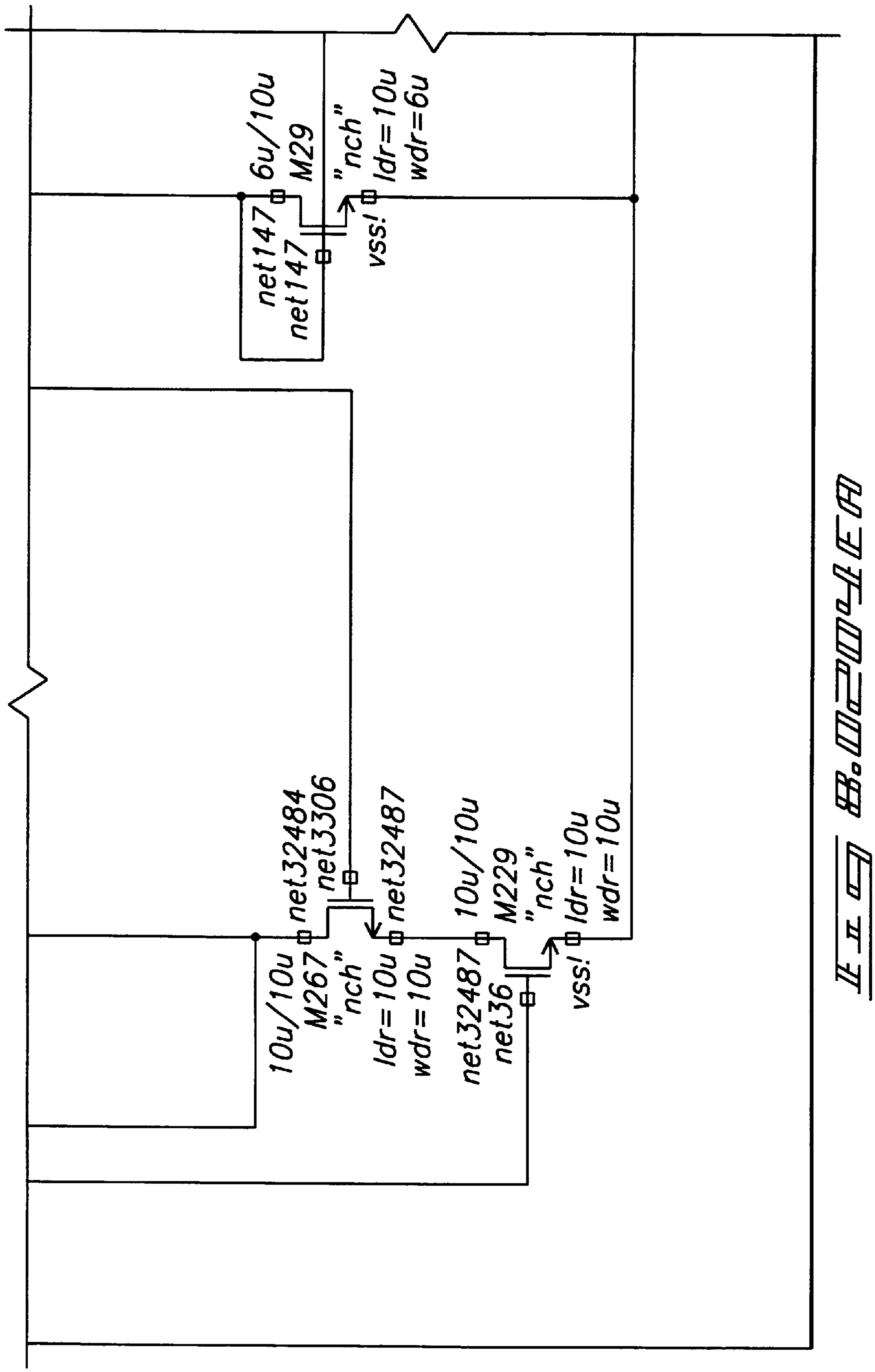
FIG. 8.0204EA

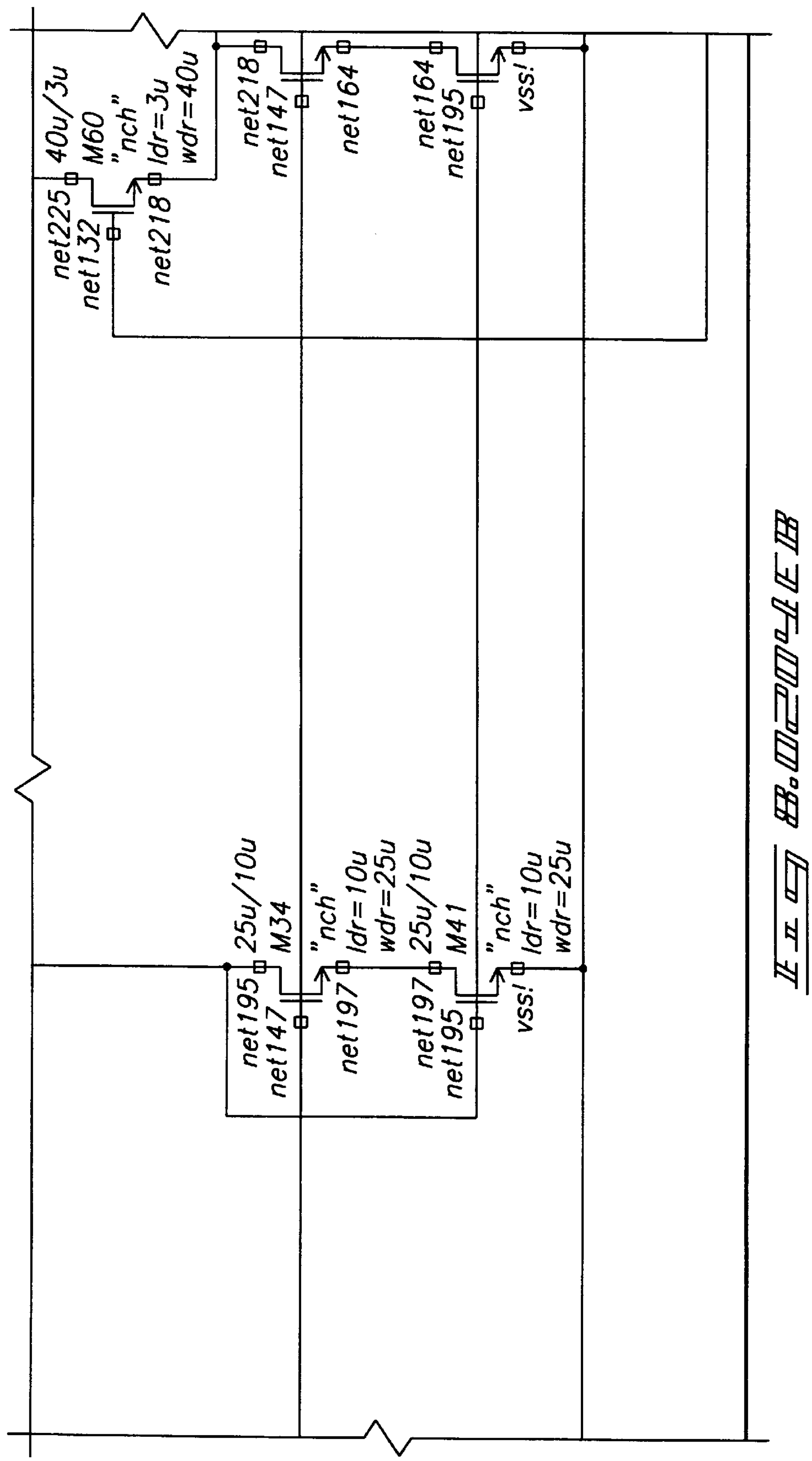
FIG. 8.020.4E B

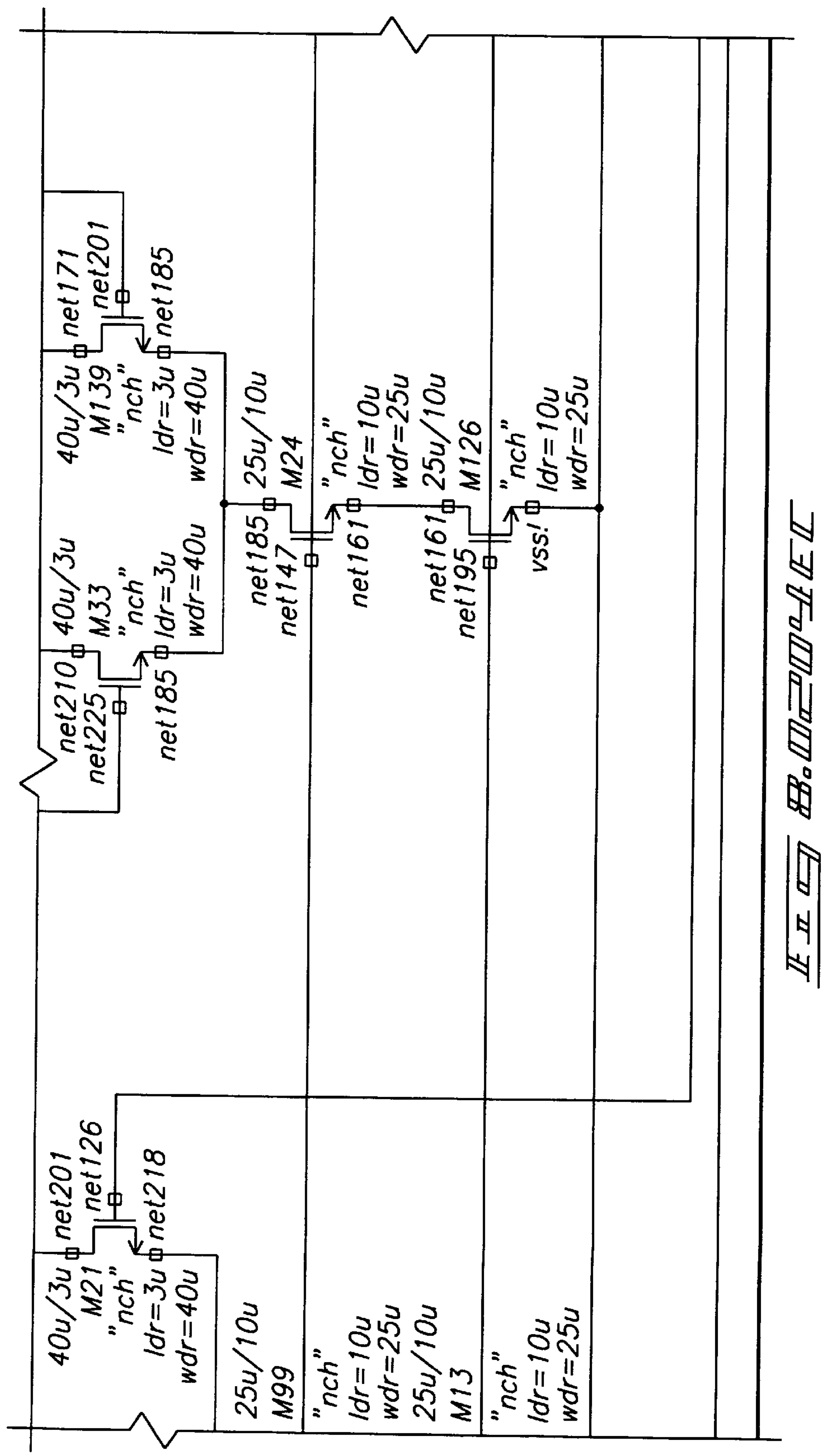
FIG. 8.0204EC

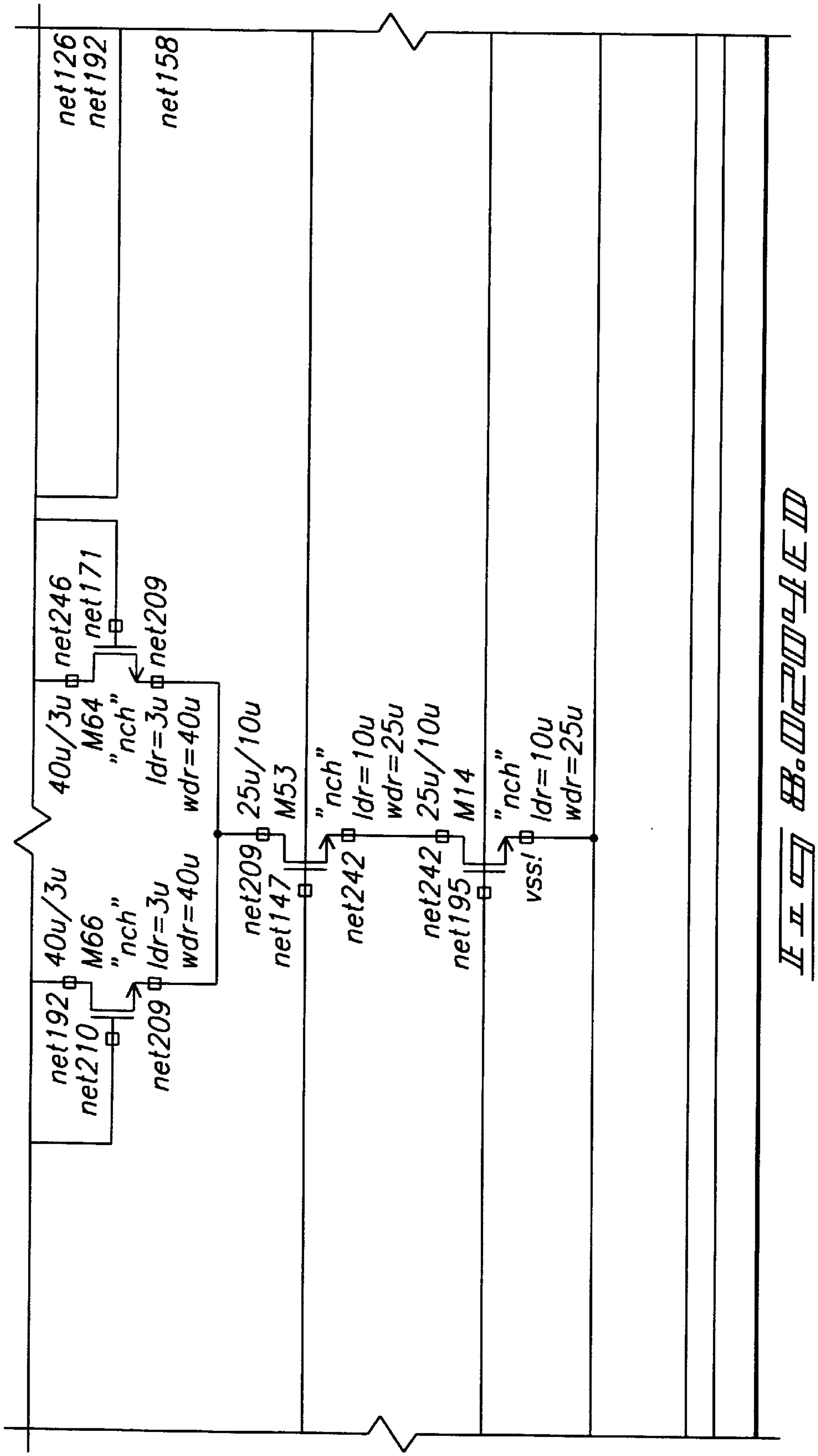
Fig. 8.0204ED

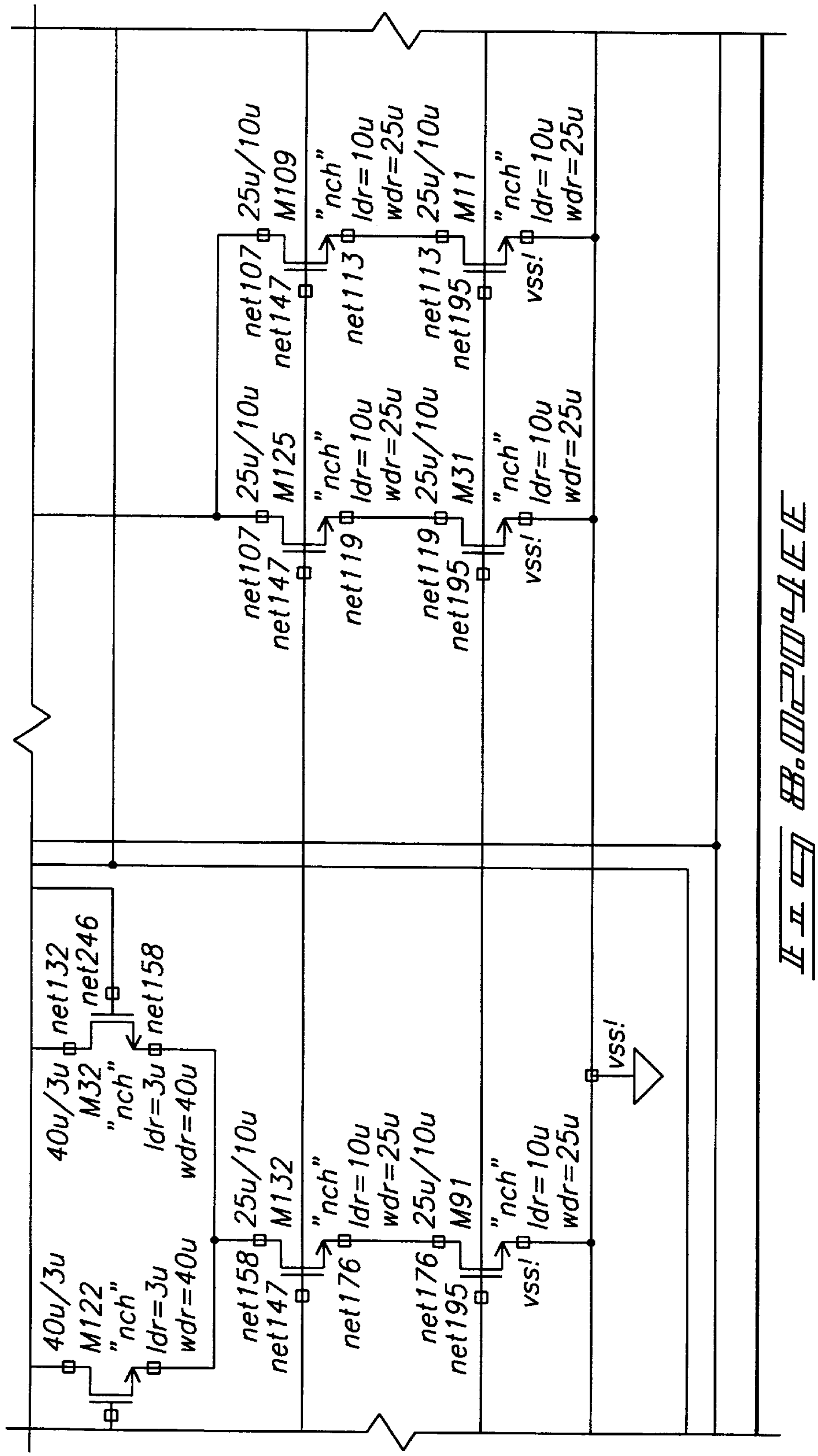
FIG. 8.204EE

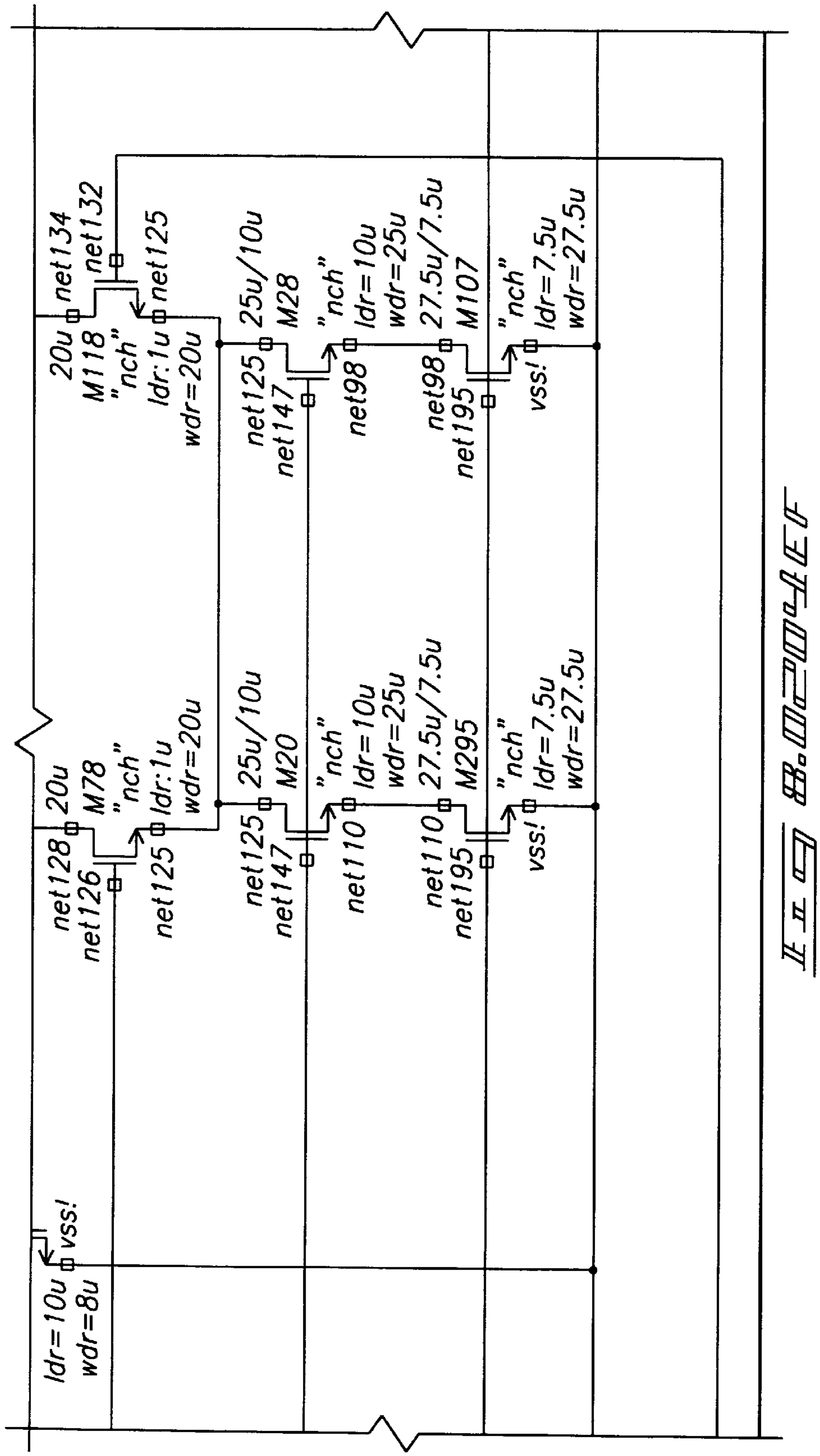
FIG. 8.020.4EF

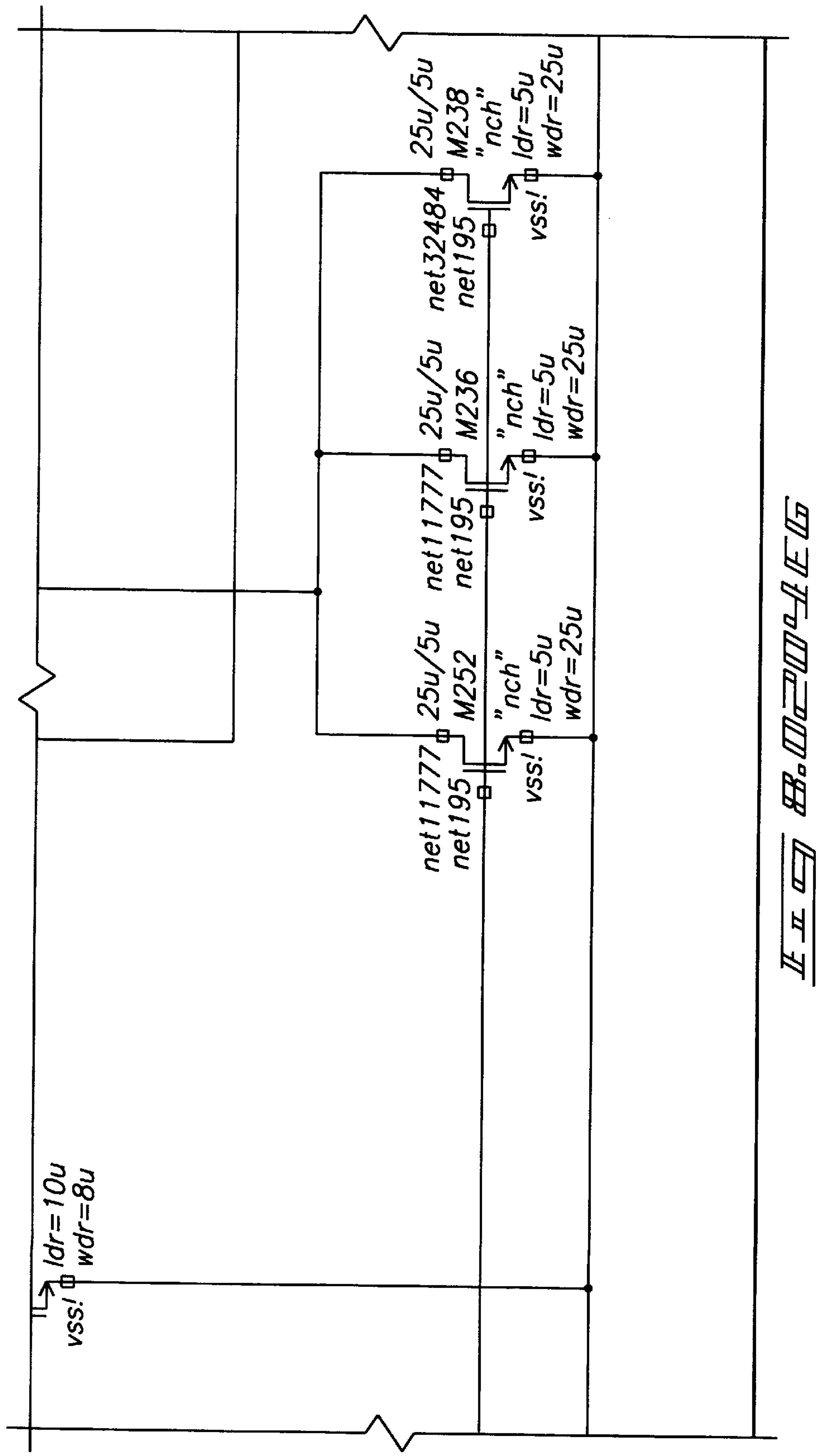
FIG. 8.0204EG

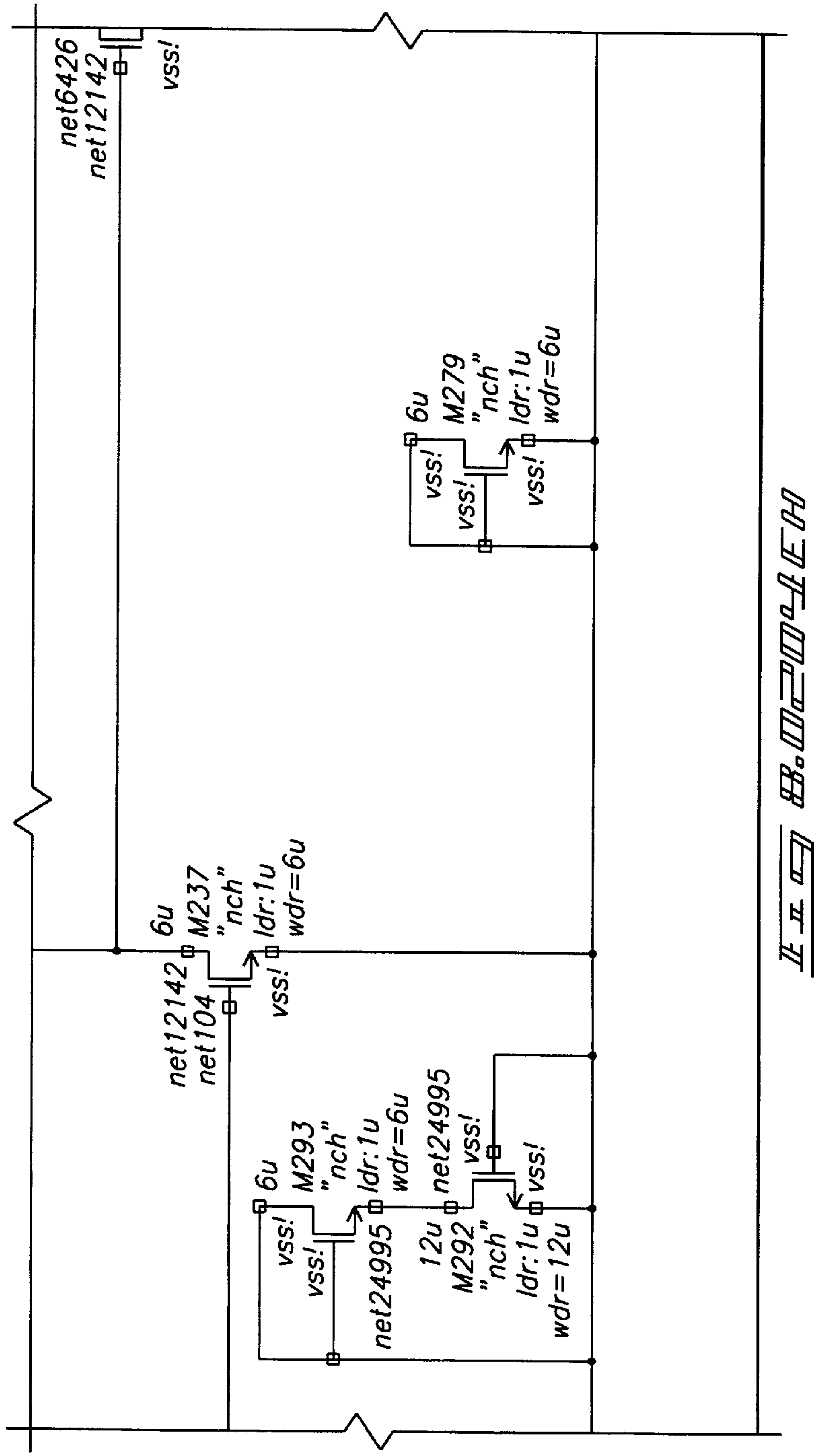
FIG. 8.020.4EH

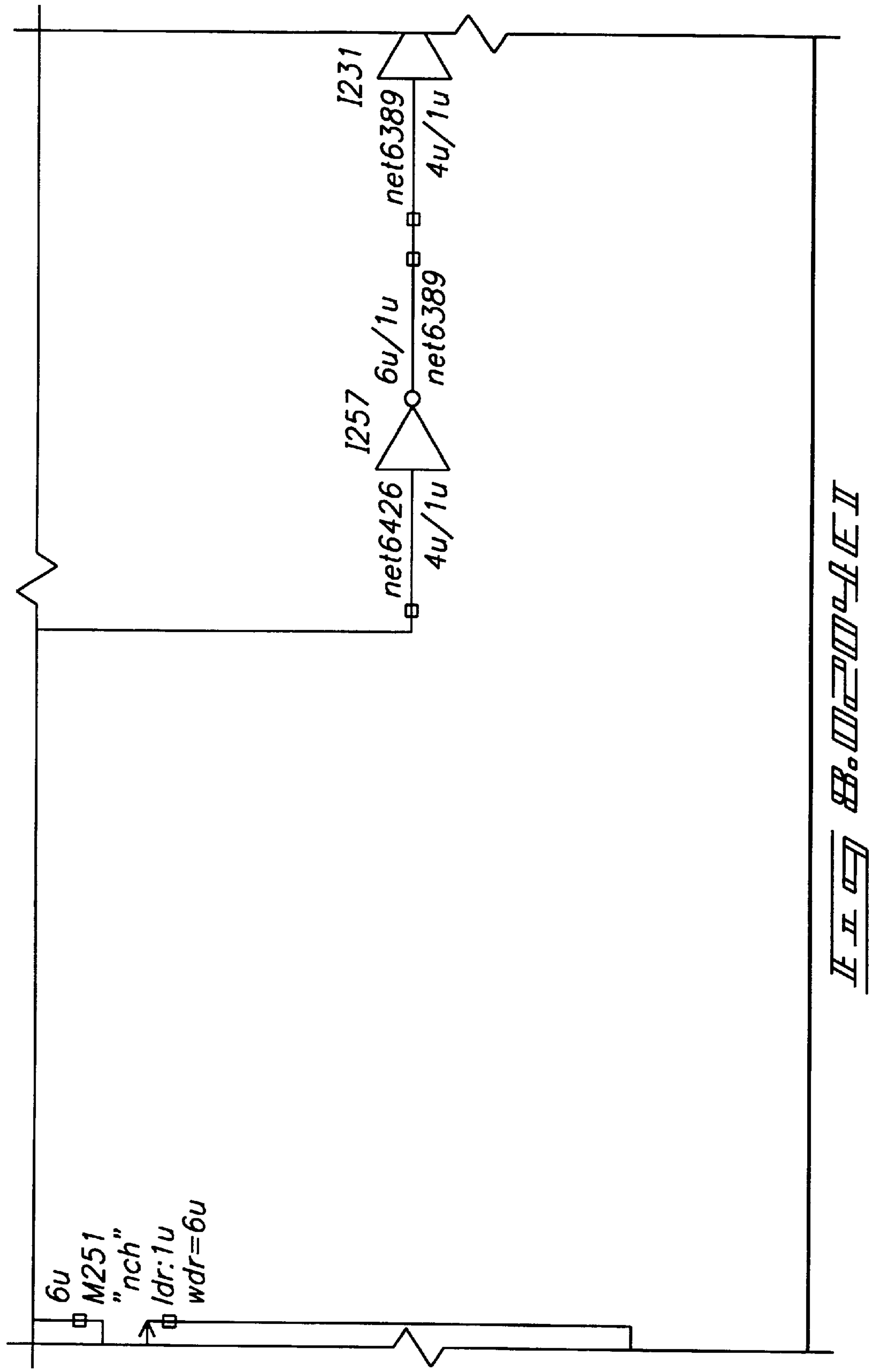
I231
net6389
4u/1u
6u/1u
net6389
I257
net6426
4u/1u
6u
M251
"nch"
ldr:1u
wdr=6u

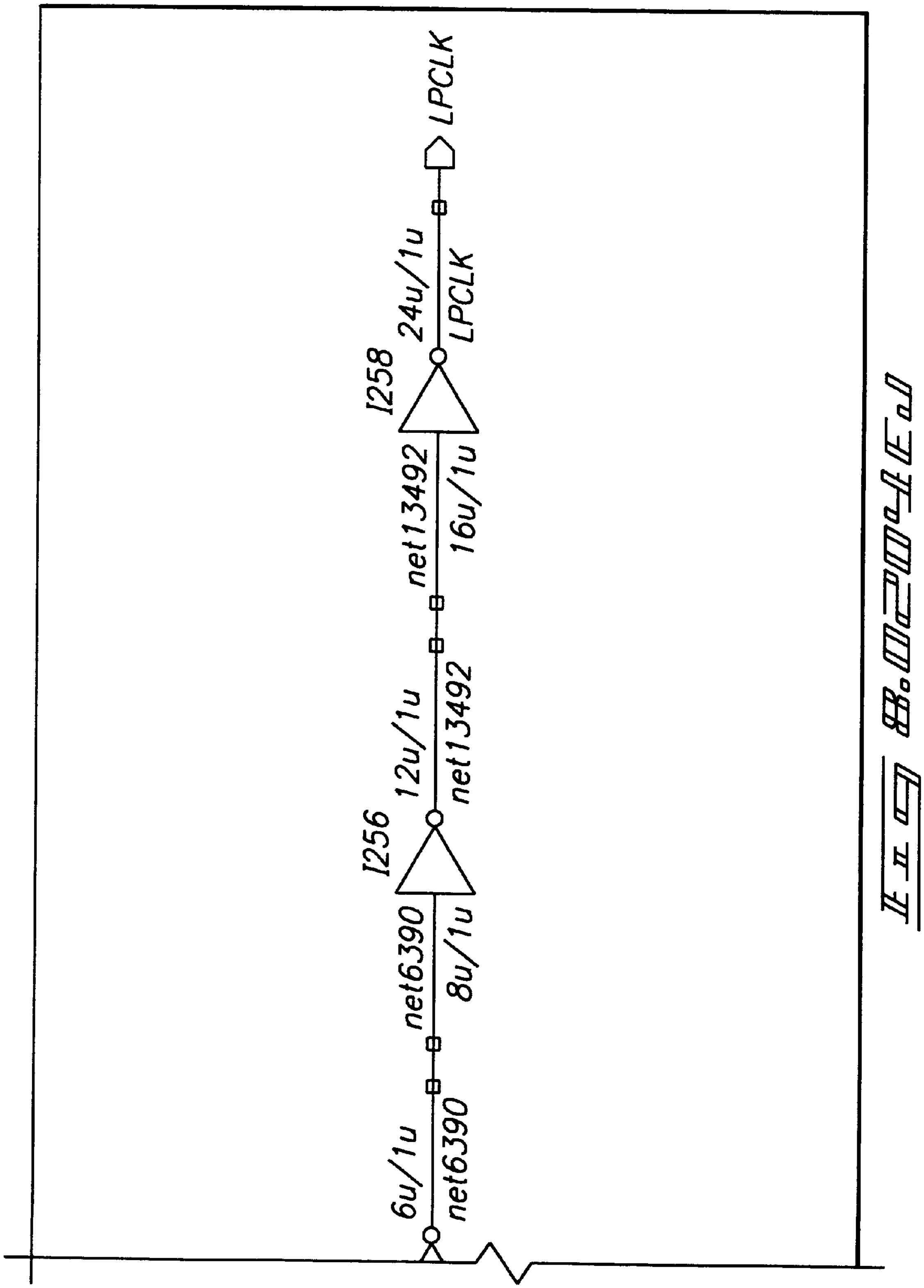
FIG. 8.820HE

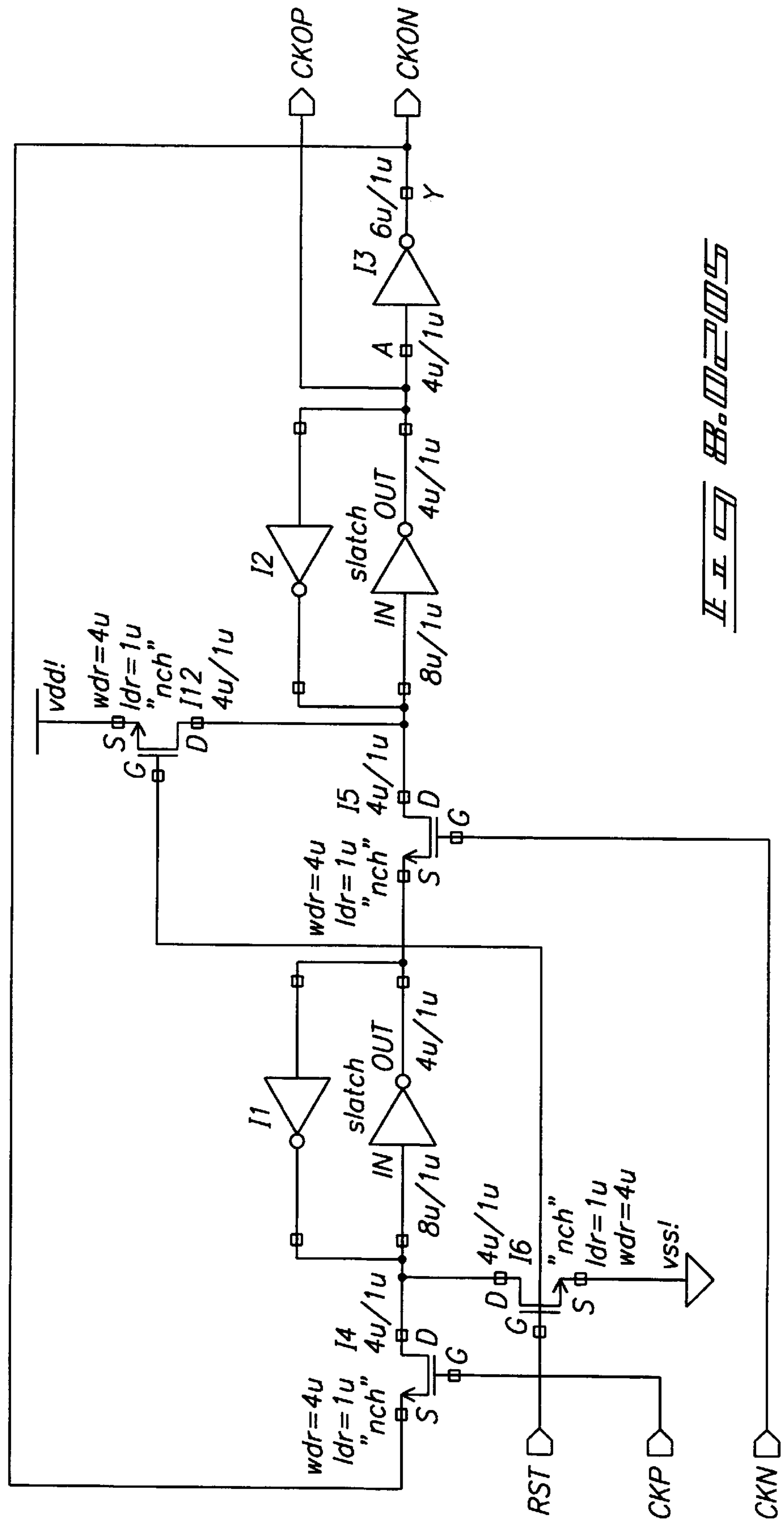
Fig 8.0205

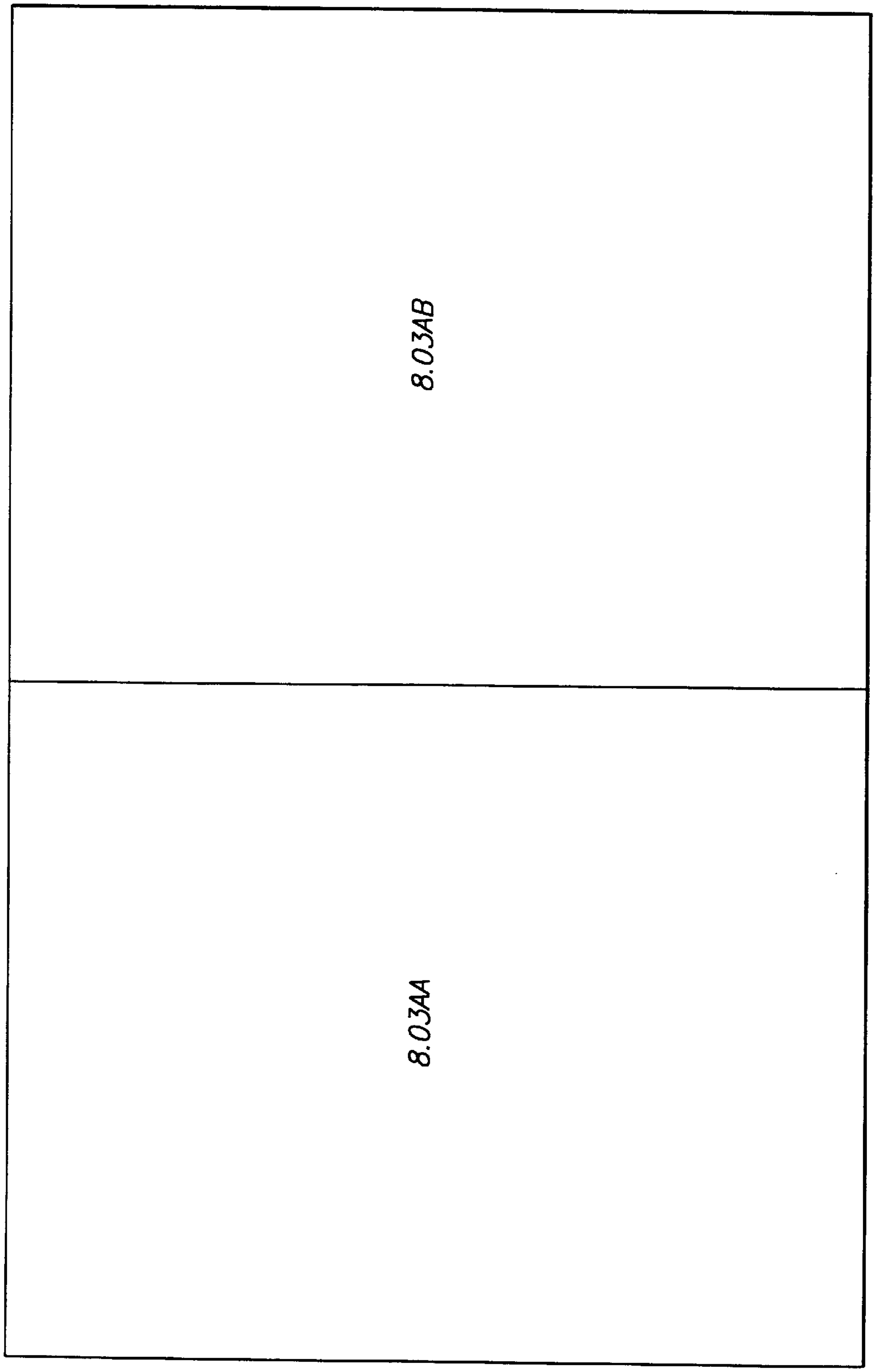
FIG. 8.03

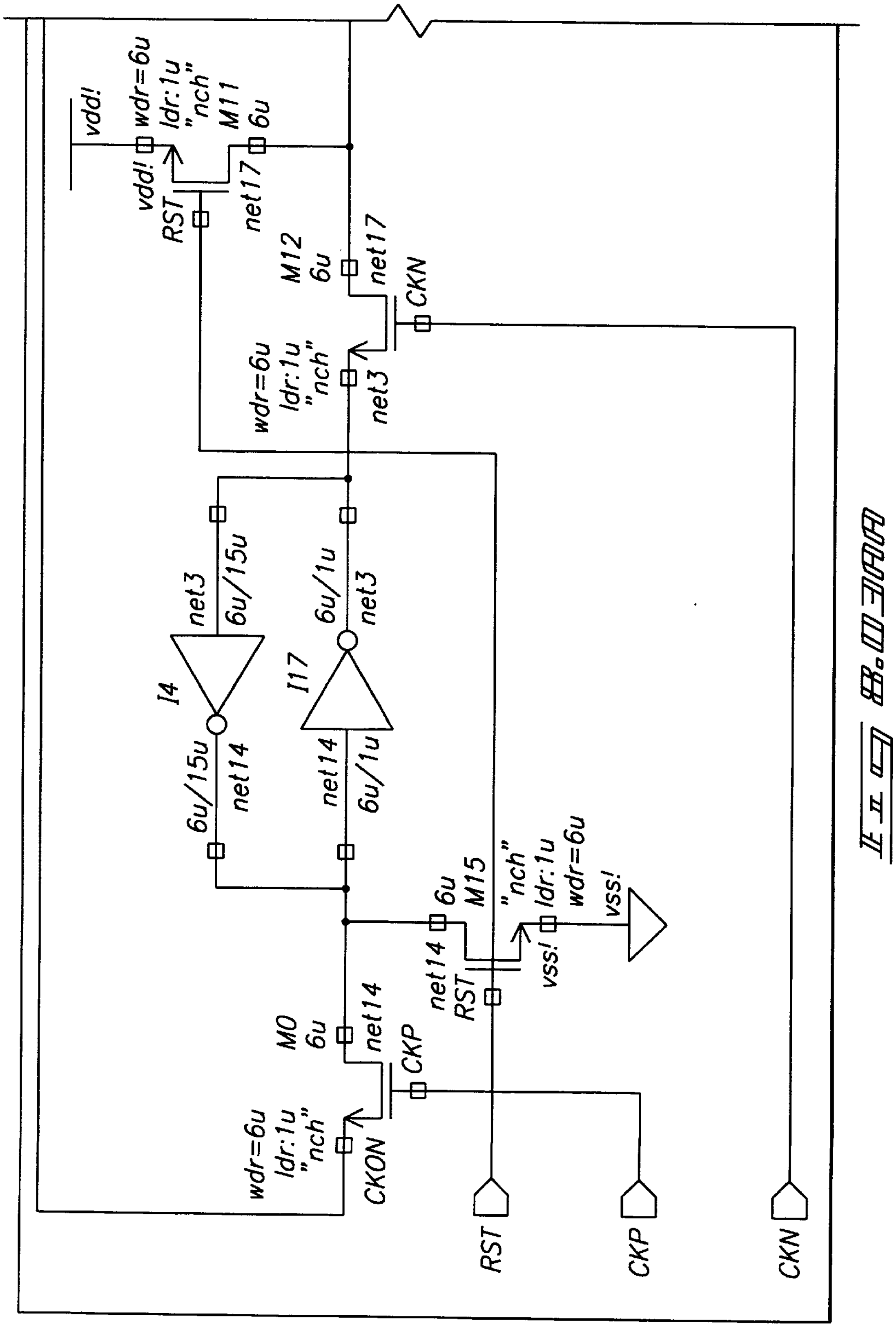
vdd!
wdr=6u
ldr:1u
"nch"
M11
6u
net17
RST
M12
CKN
net3
I4
I17
6u/15u
6u/1u
net14
M15
vss!
M0
CKP
CKON

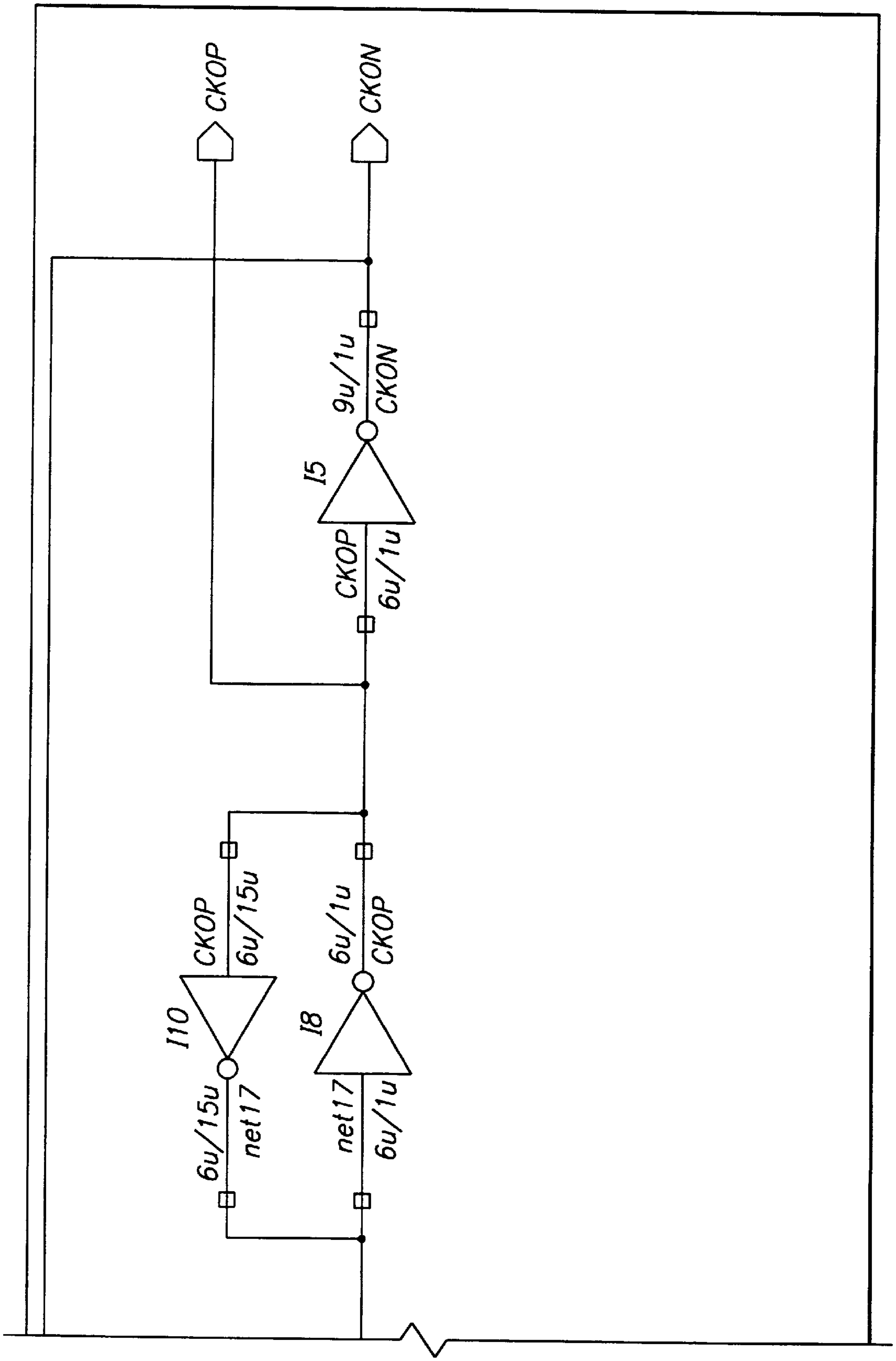
FIG. 8.0EAB

| | | | | | |
|---|---|---|---|---|---|
| 8.04AA | 8.04AB | 8.04AC | 8.04AD | 8.04AE | 8.04AF |
| 8.04BA | 8.04BB | 8.04BC | 8.04BD | 8.04BE | 8.04BF |
| 8.04CA | 8.04CB | 8.04CC | 8.04CD | 8.04CE | 8.04CF |
| 8.04DA | 8.04DB | 8.04DC | 8.04DD | 8.04DE | |
| 8.04EA | 8.04EB | 8.04EC | 8.04ED | 8.04EE | |

FIG. 8.04

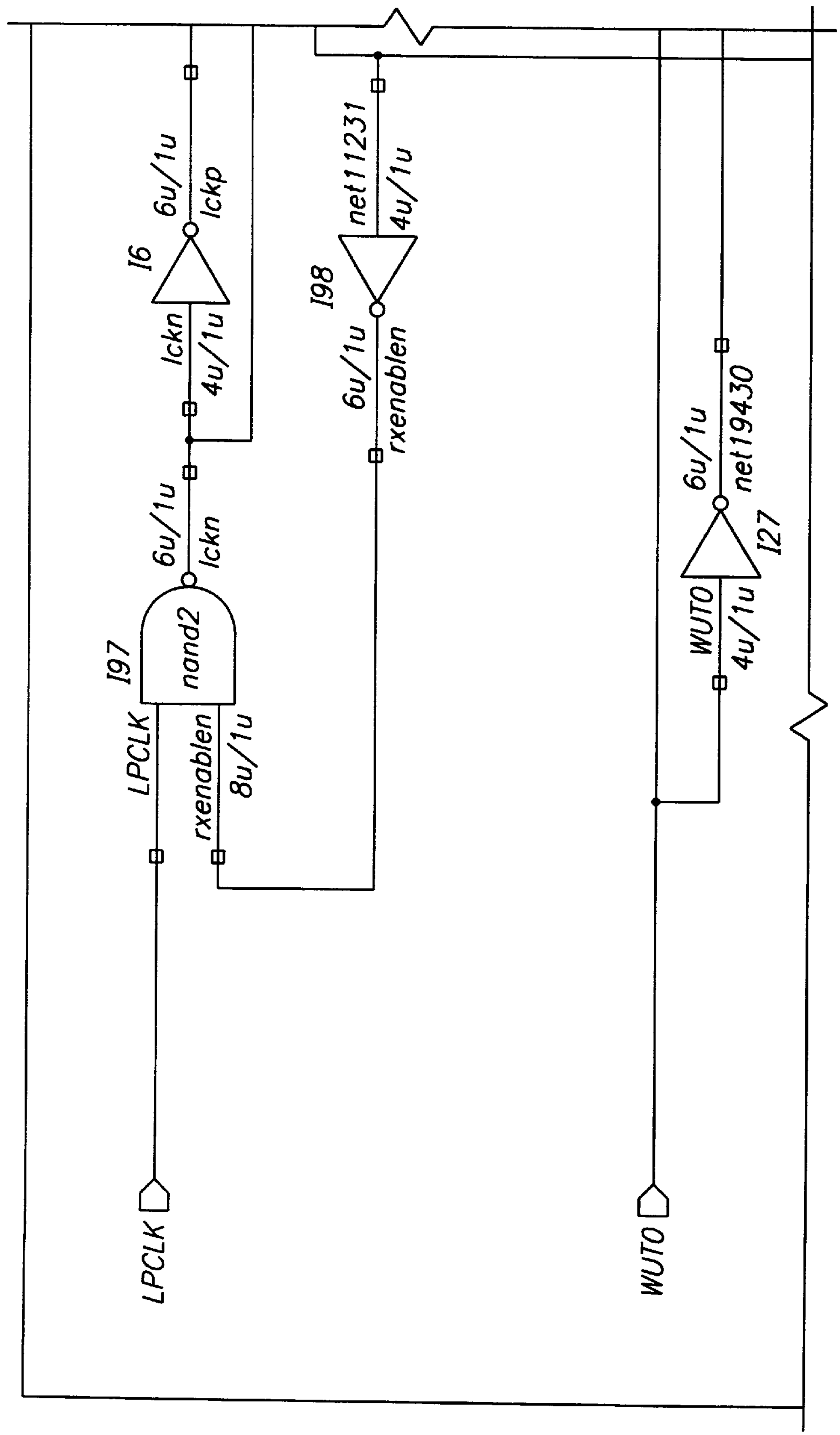
Fig. 8.07AA

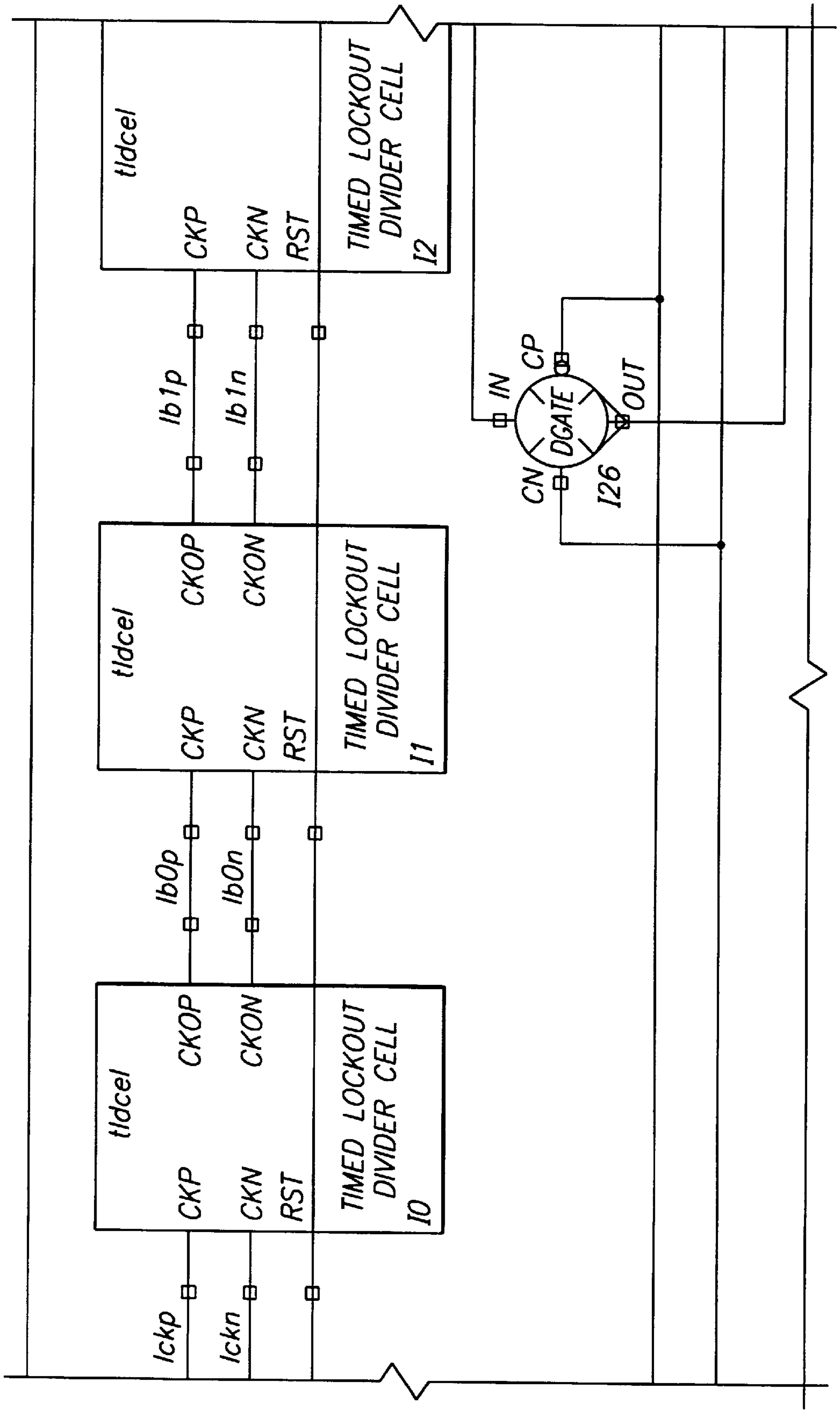
Fig. 8.04AB

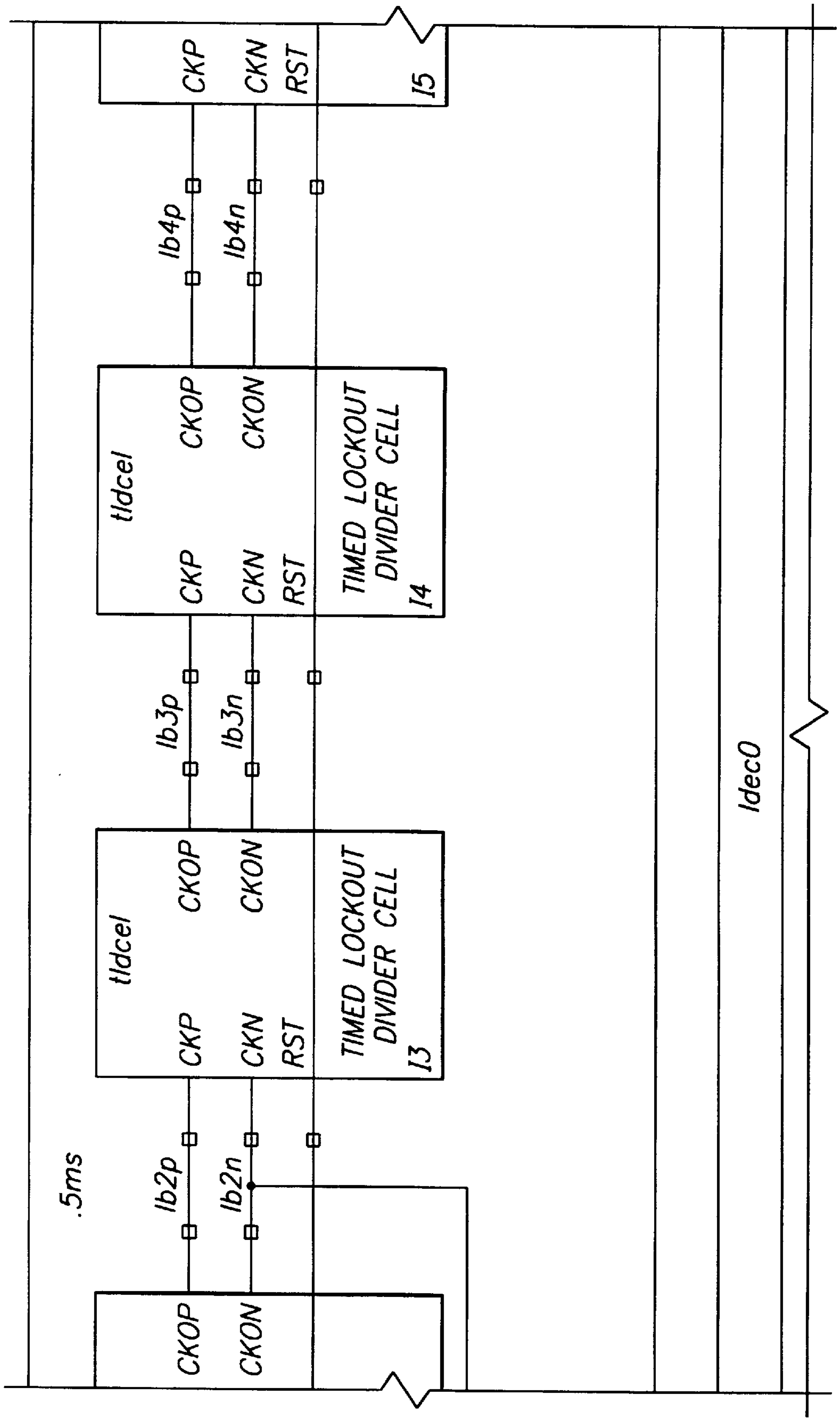
FIG. 8.04AL

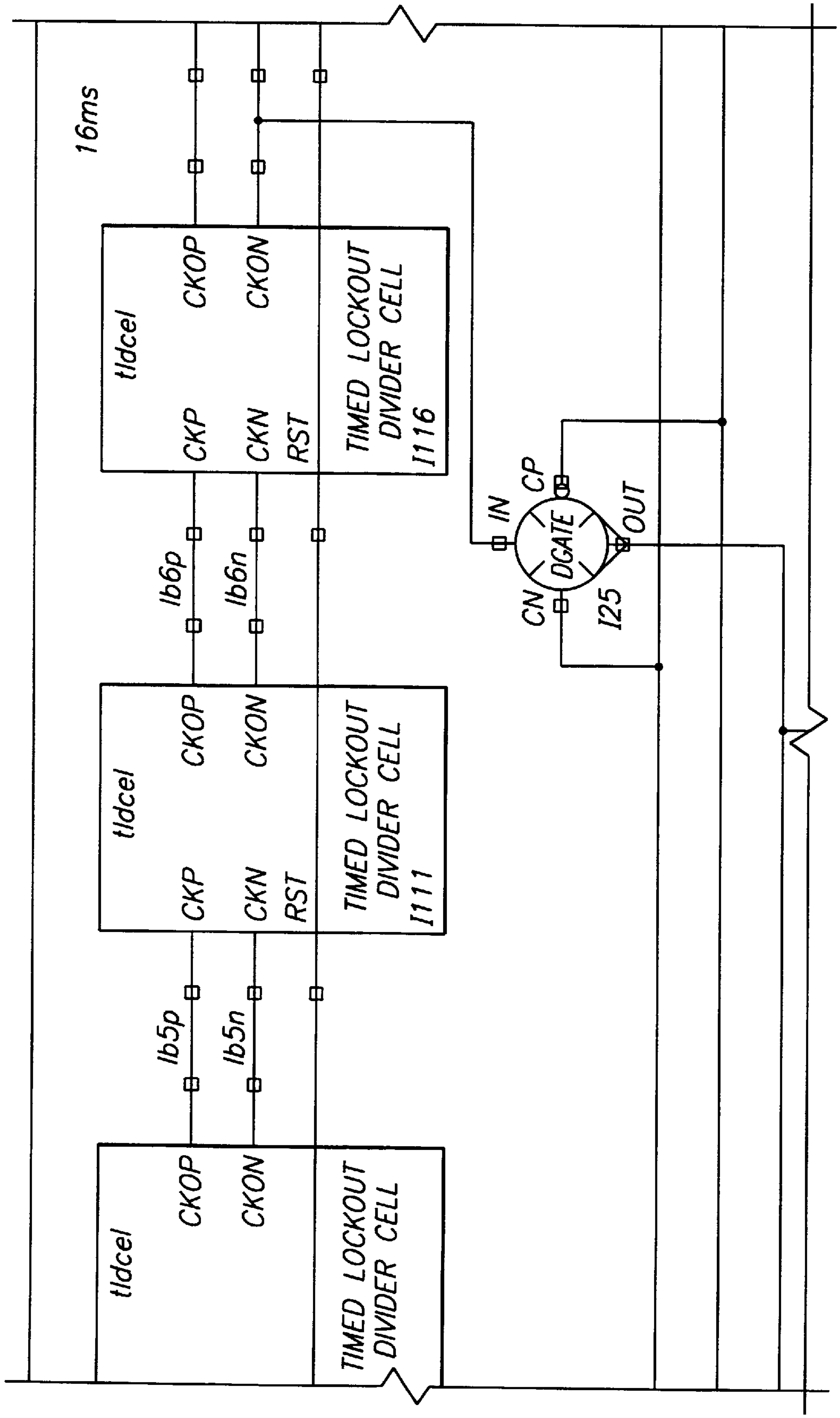
Fig. 8.07AD

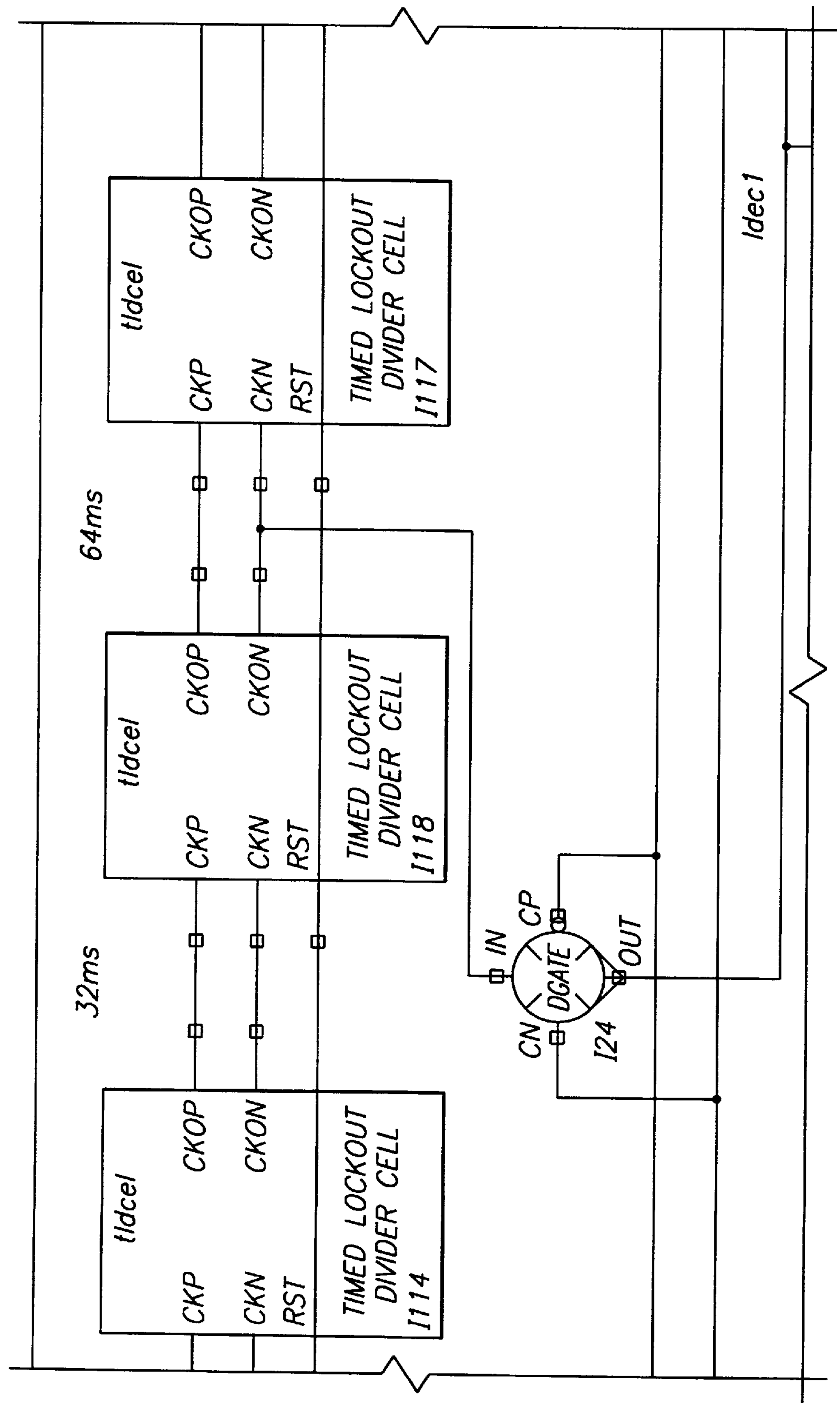
Fig. 8.004AE

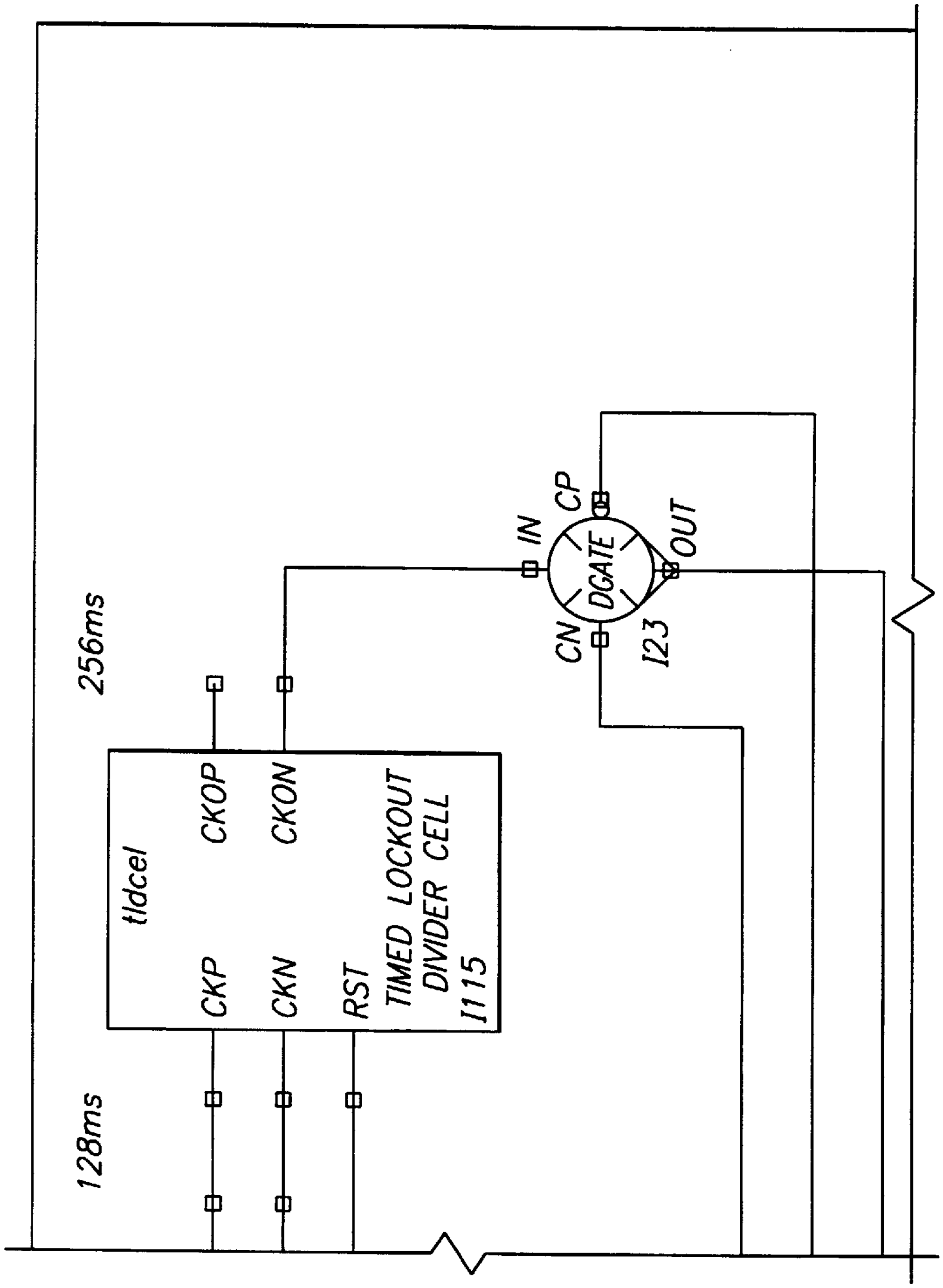
FIG 8.04AF

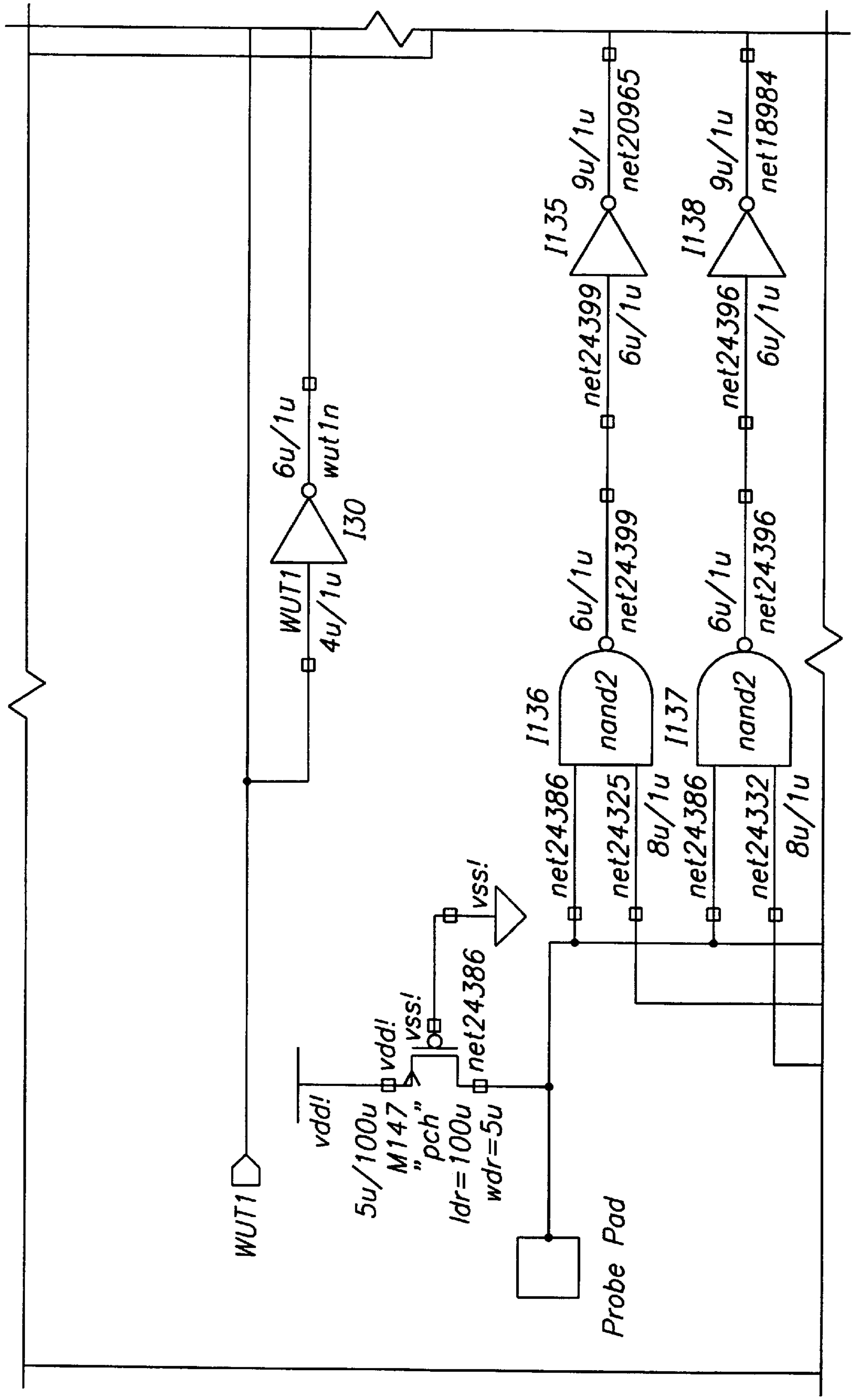
Fig. 8.04BA

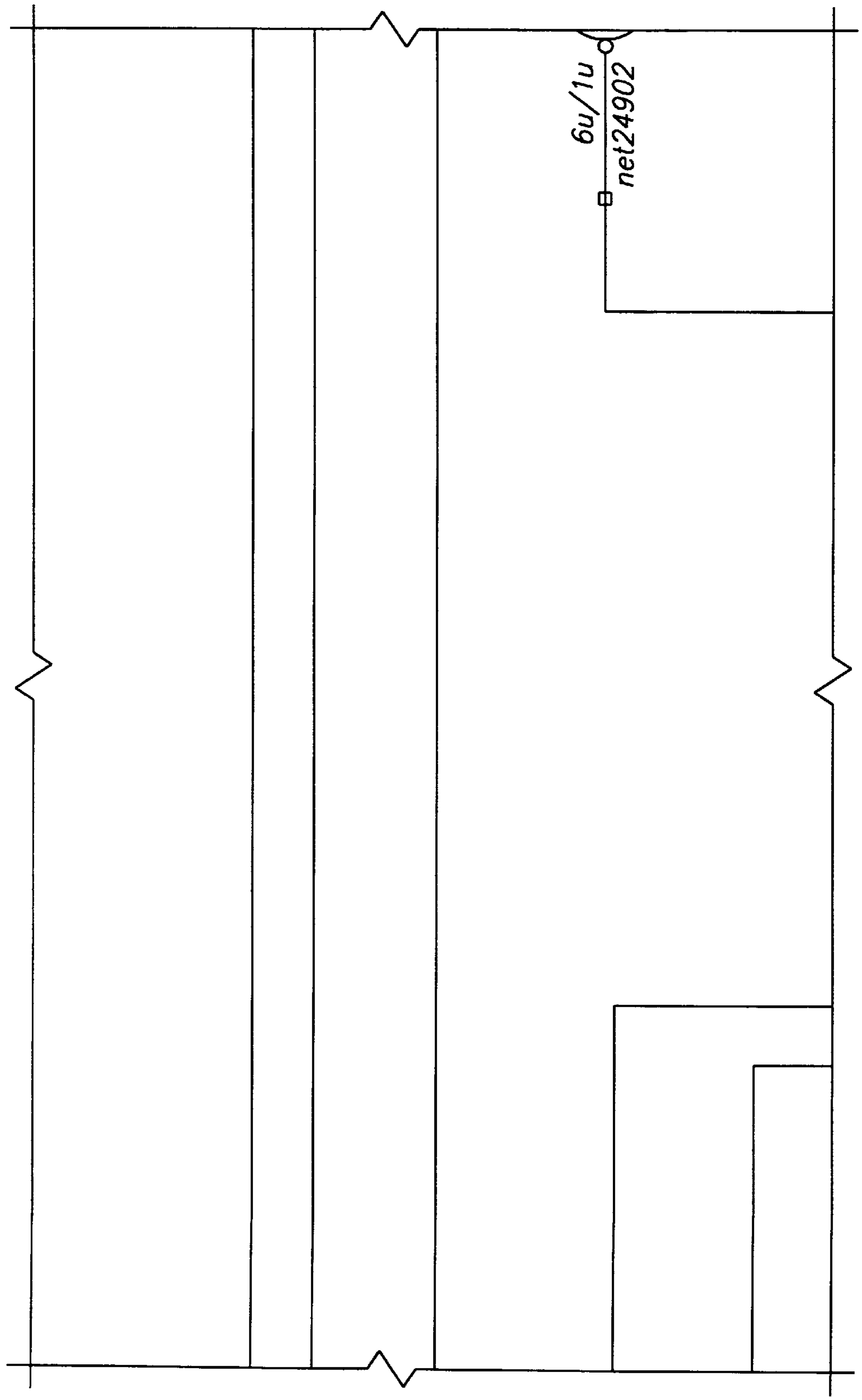
FIG. 8.04BB

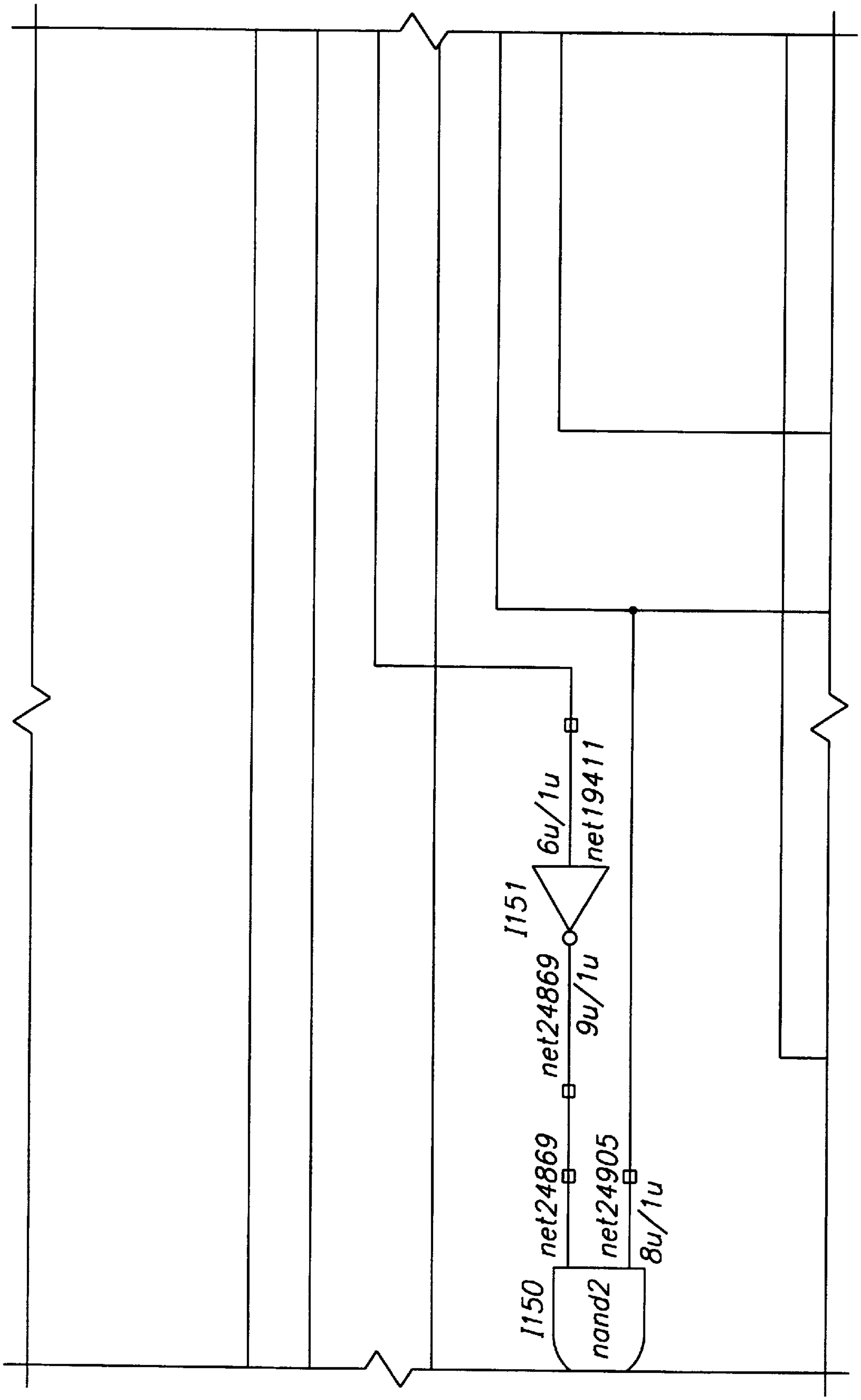
Fig. 8.04BC

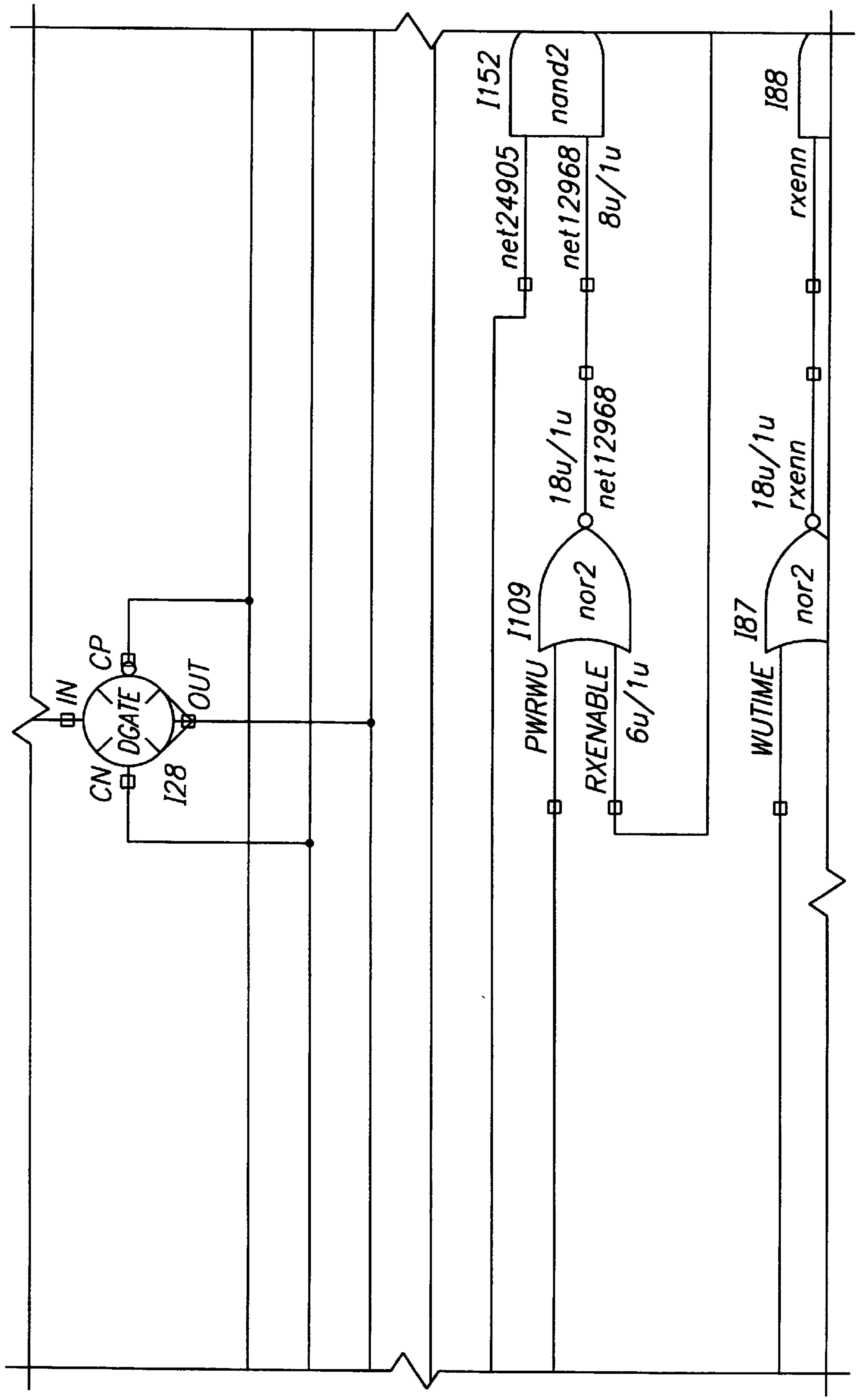
FIG. 8.04BD

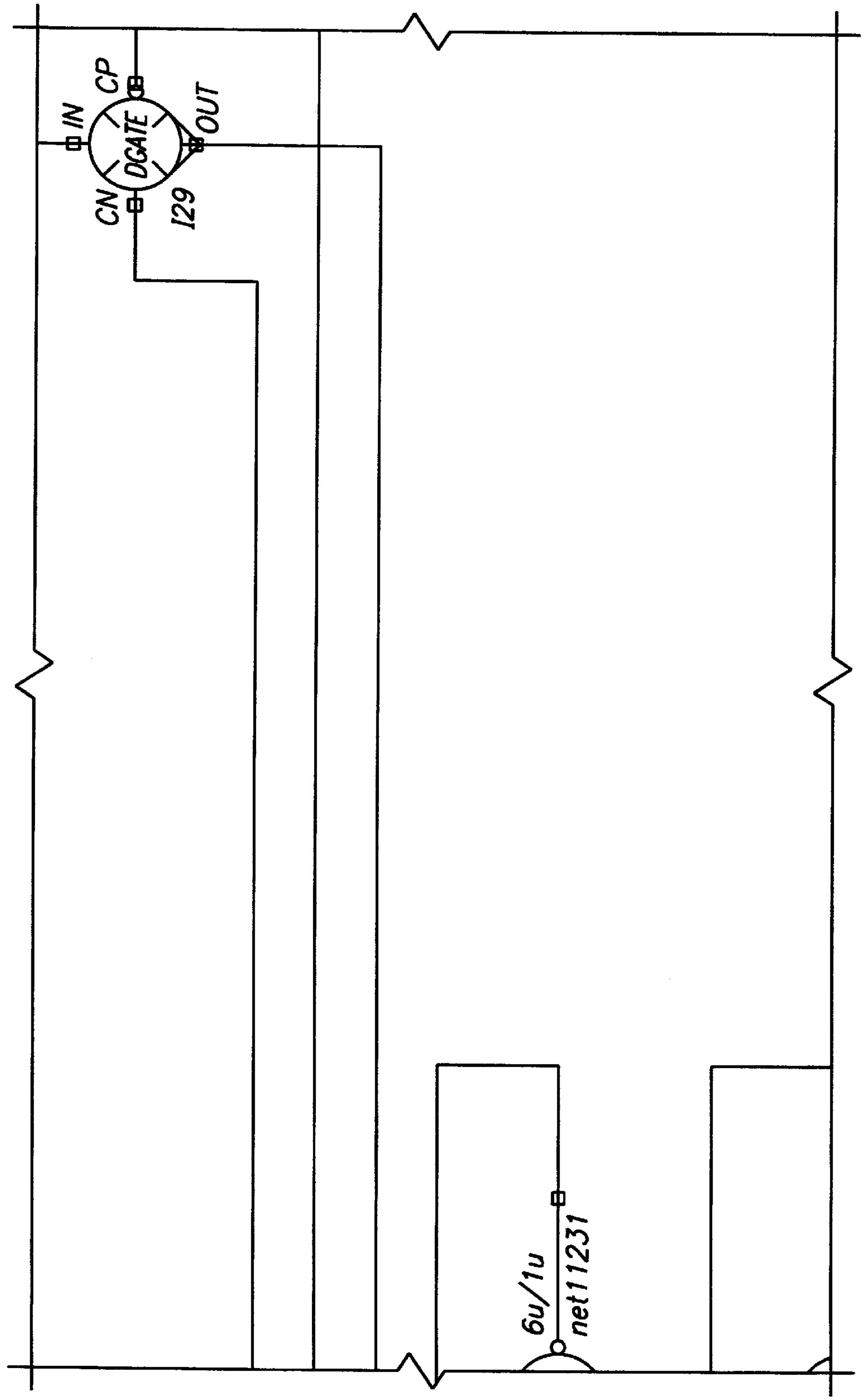
FIG. 8.04BE

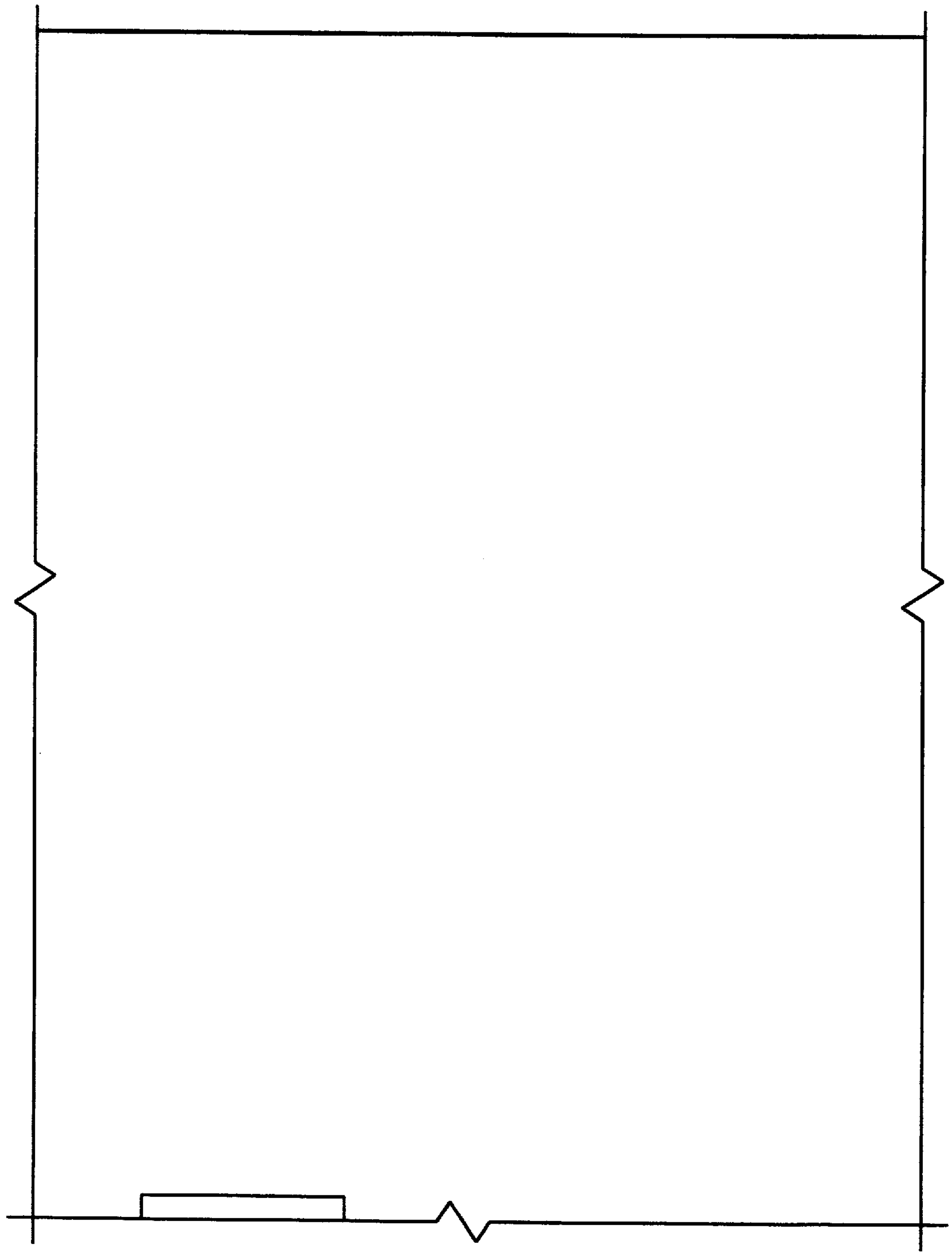
FIG. 8.07BF

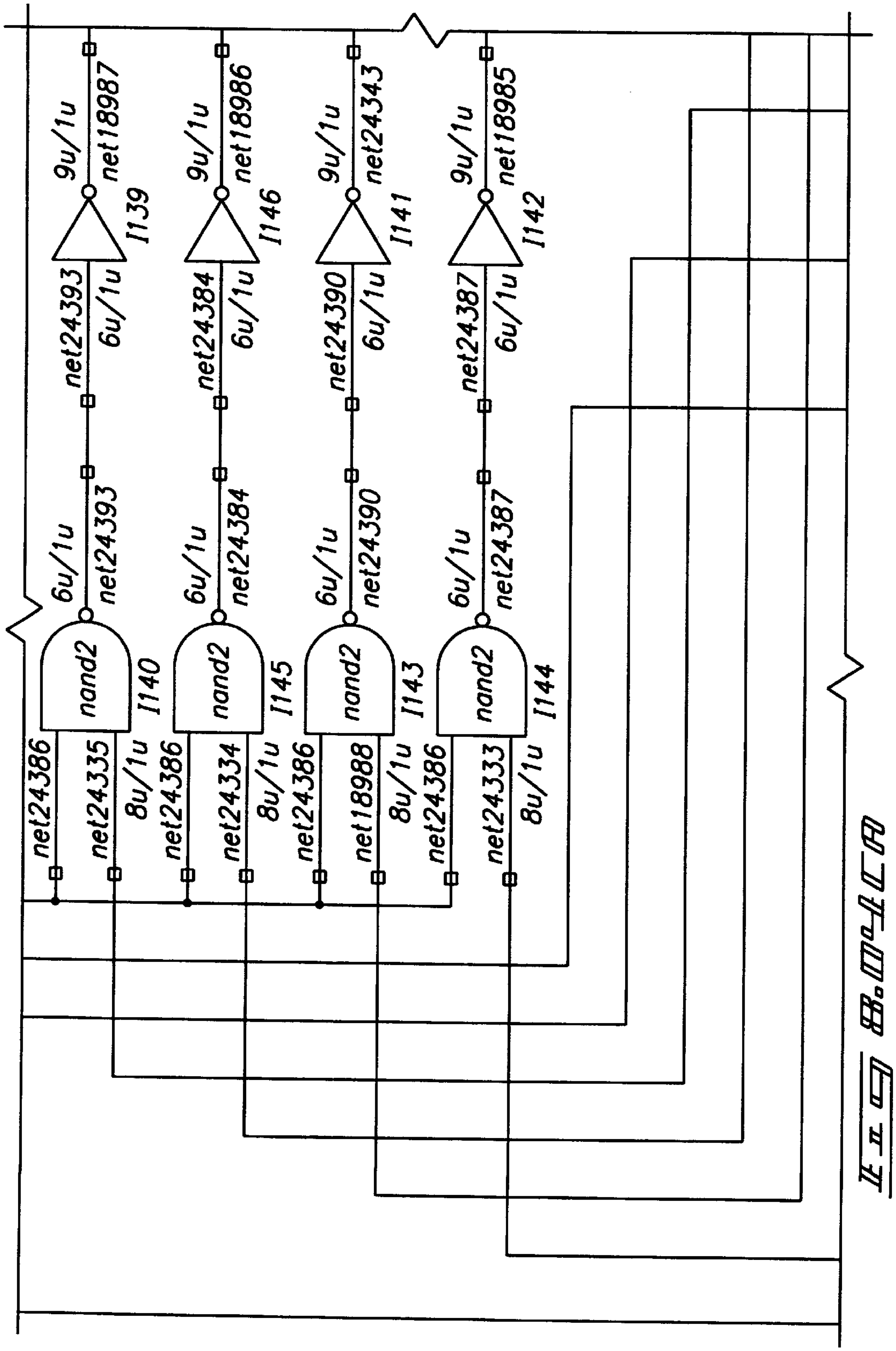
Fig. 8.074CA

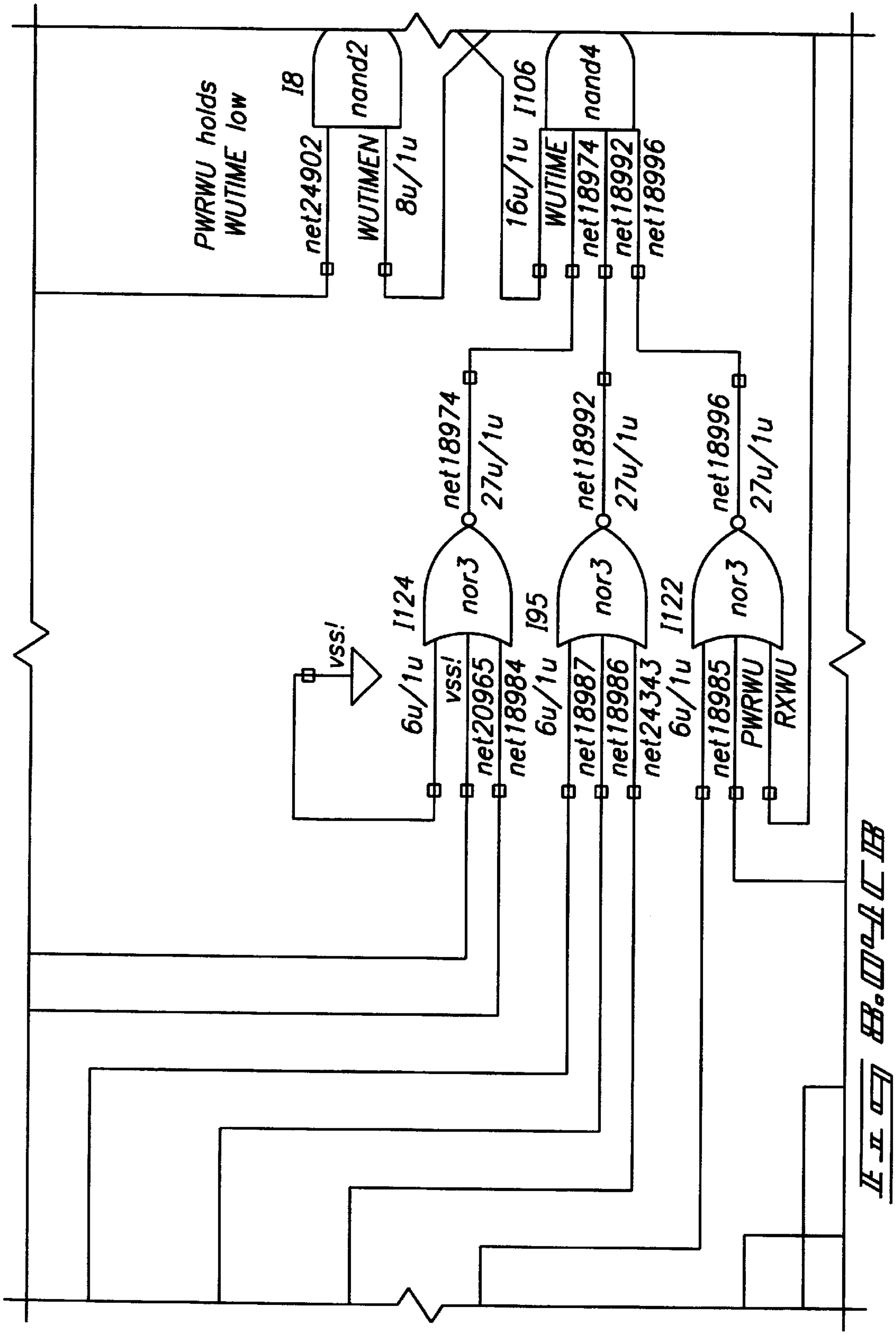
FIG. 8.04CB

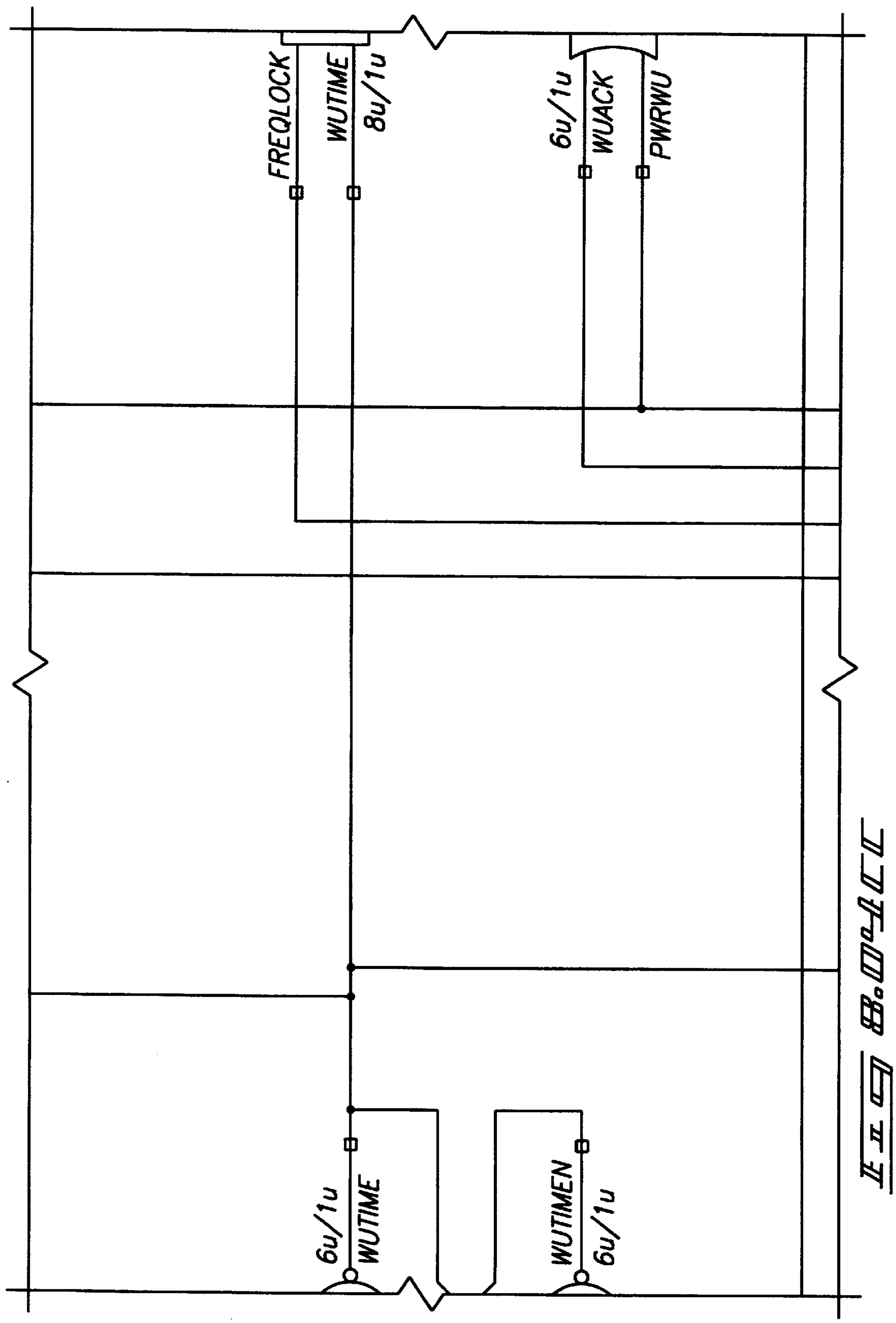
FIG. 8.0.4CC

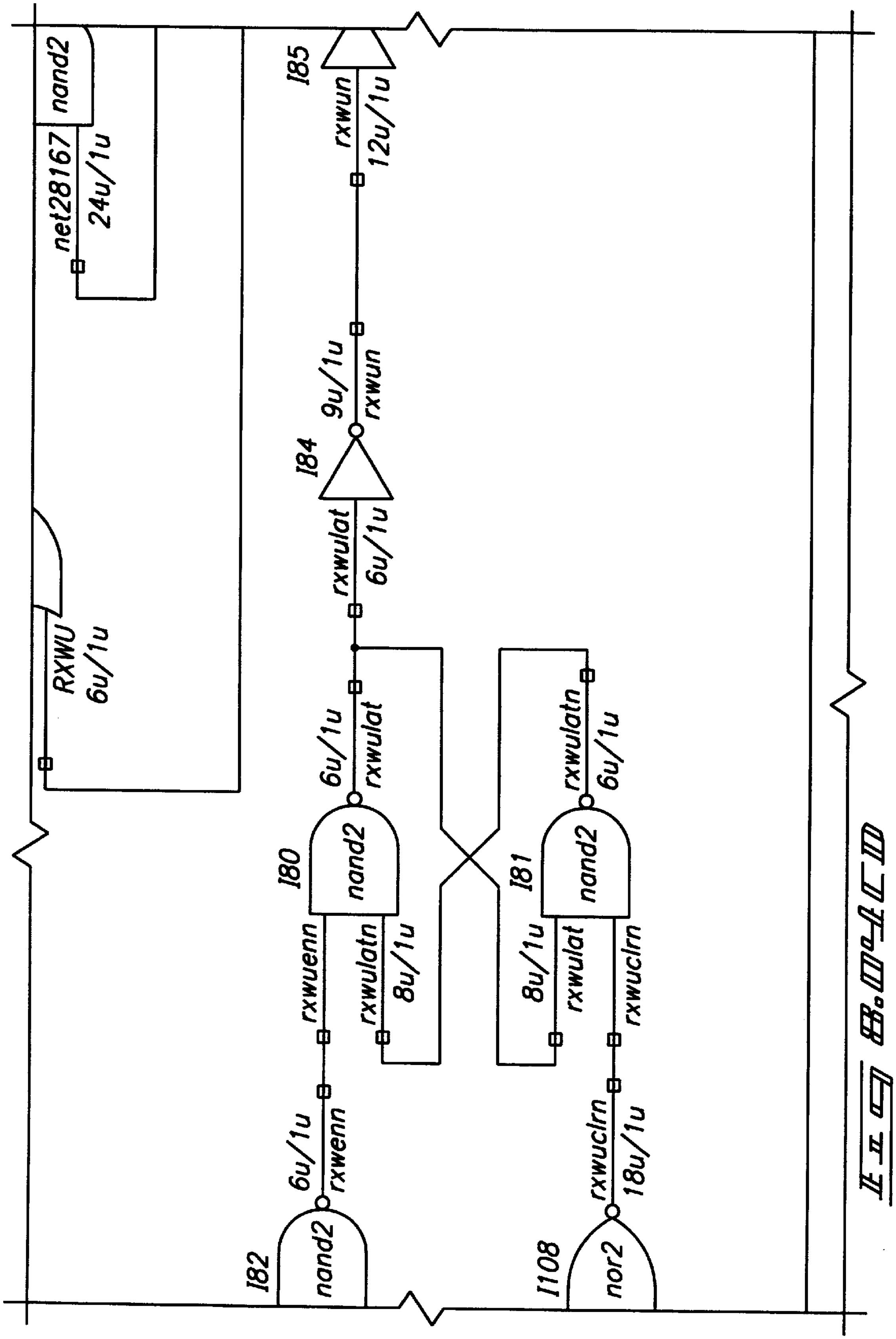
Fig. 8.04CD

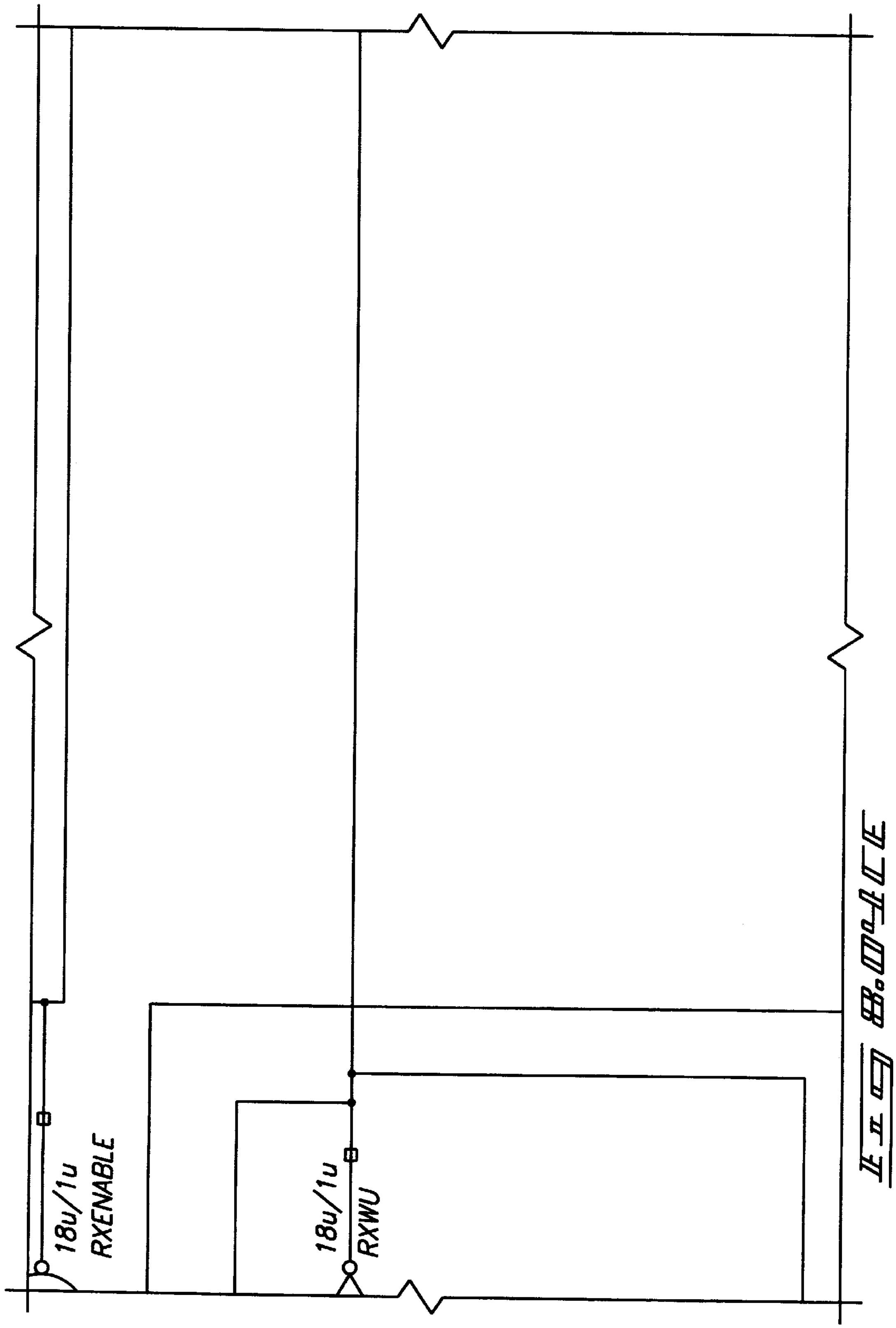
FIG. 8.04CE

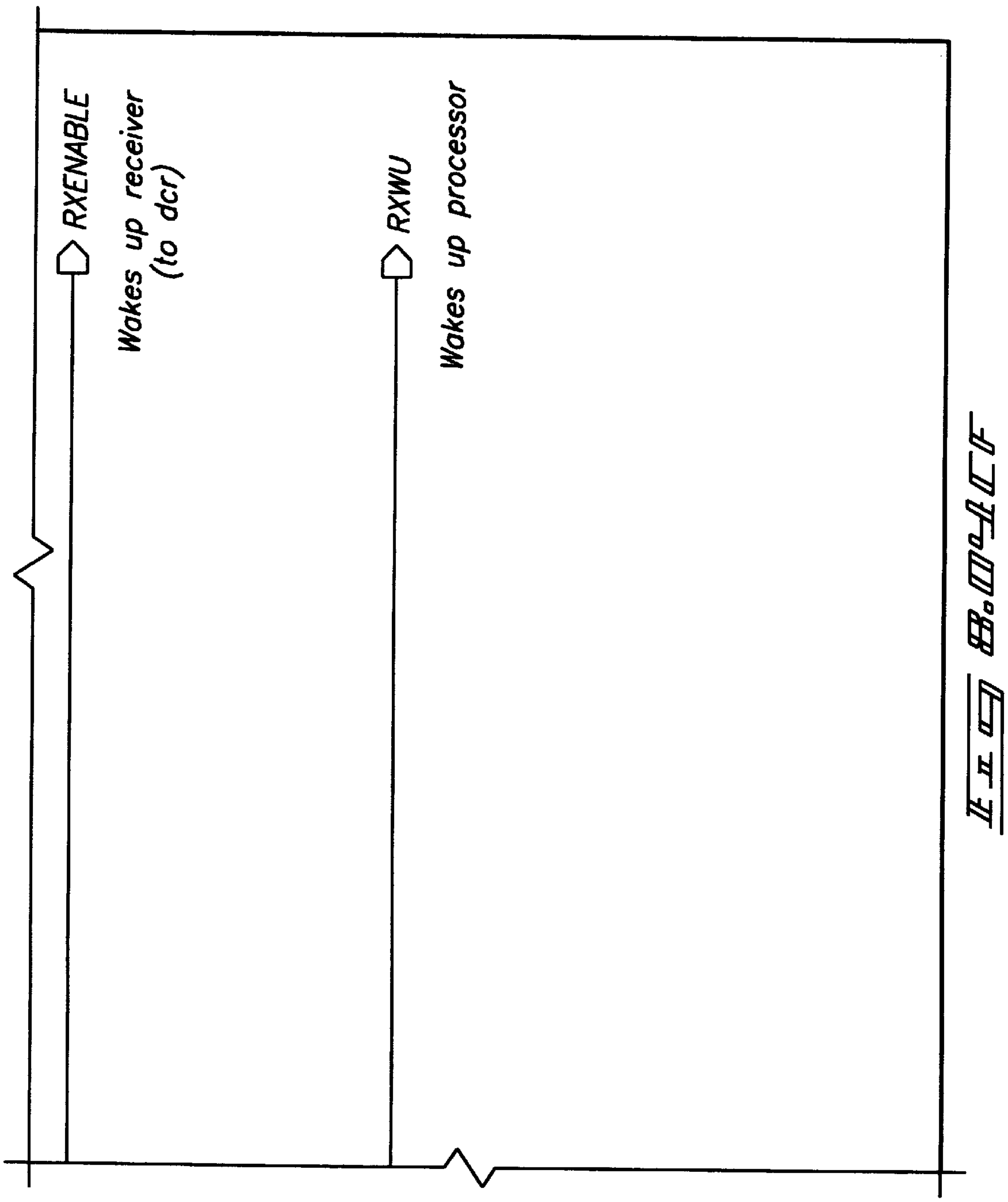
Fig. 8.04CF

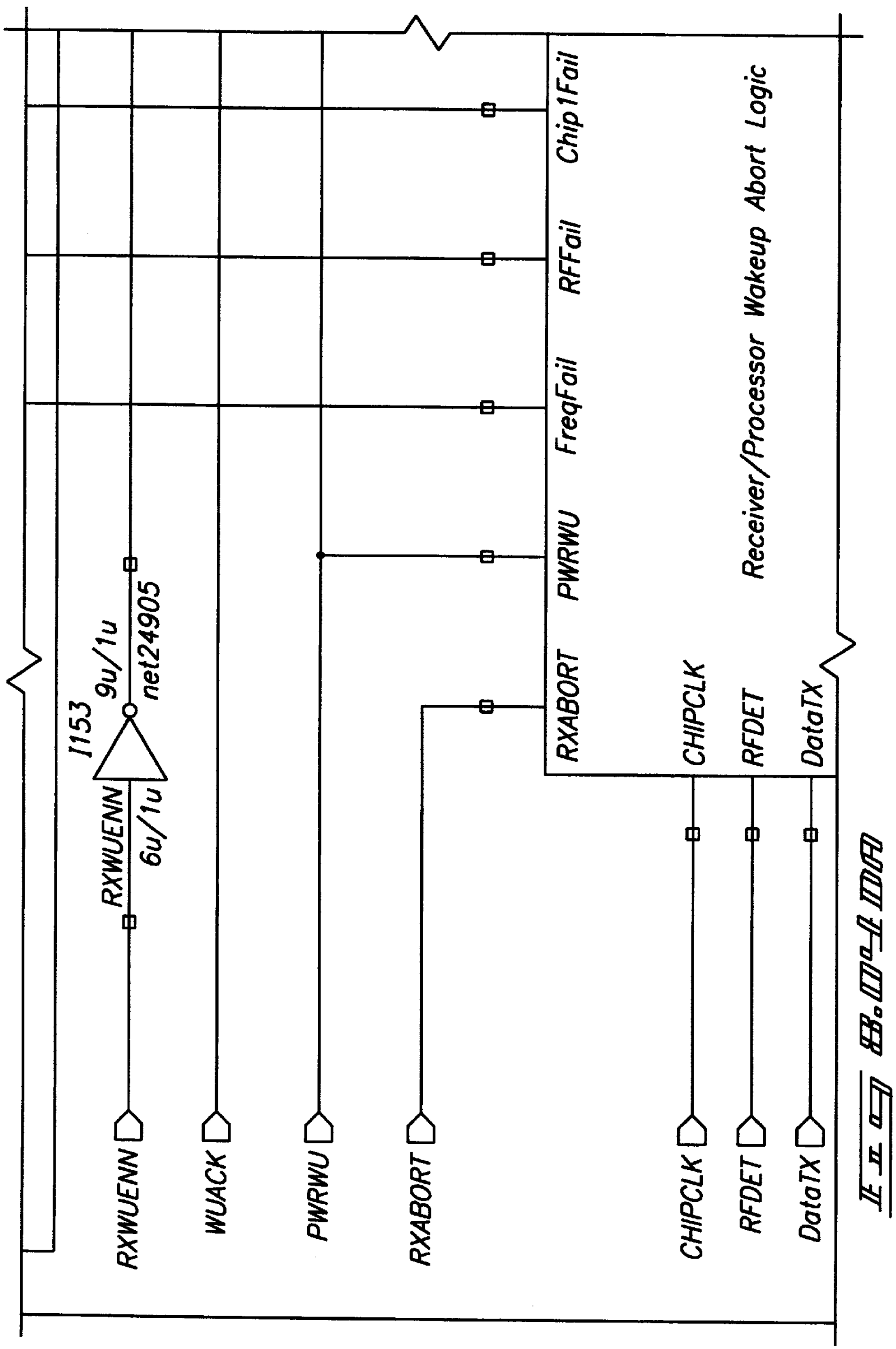
Chip1Fail
RFFail
FreqFail
PWRWU
RXABORT
CHIPCLK
RFDET
DataTX
Receiver/Processor Wakeup Abort Logic
I153
9u/1u
net24905
RXWUENN
6u/1u
RXWUENN
WUACK
PWRWU
RXABORT
CHIPCLK
RFDET
DataTX

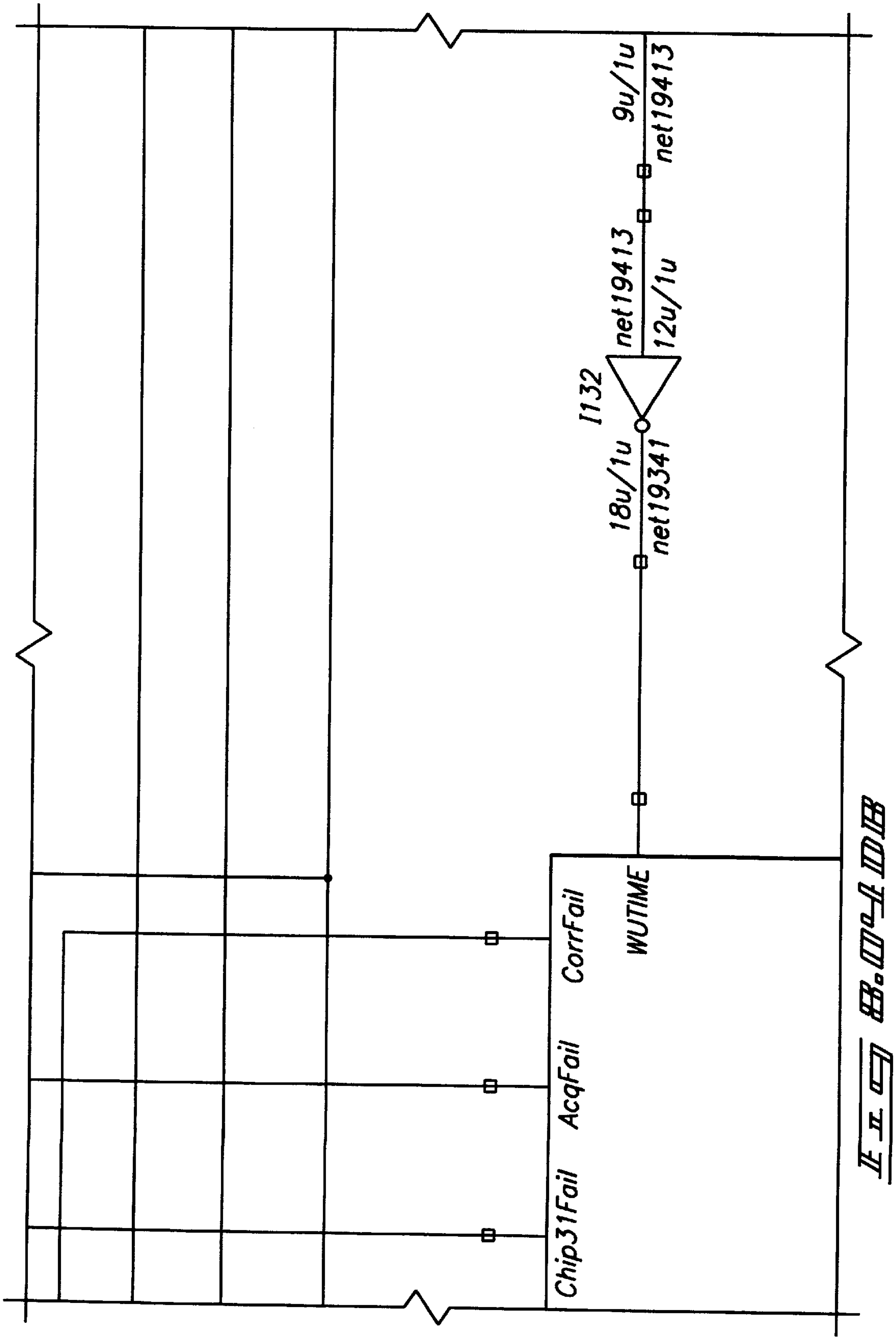
Fig. 8.04DB

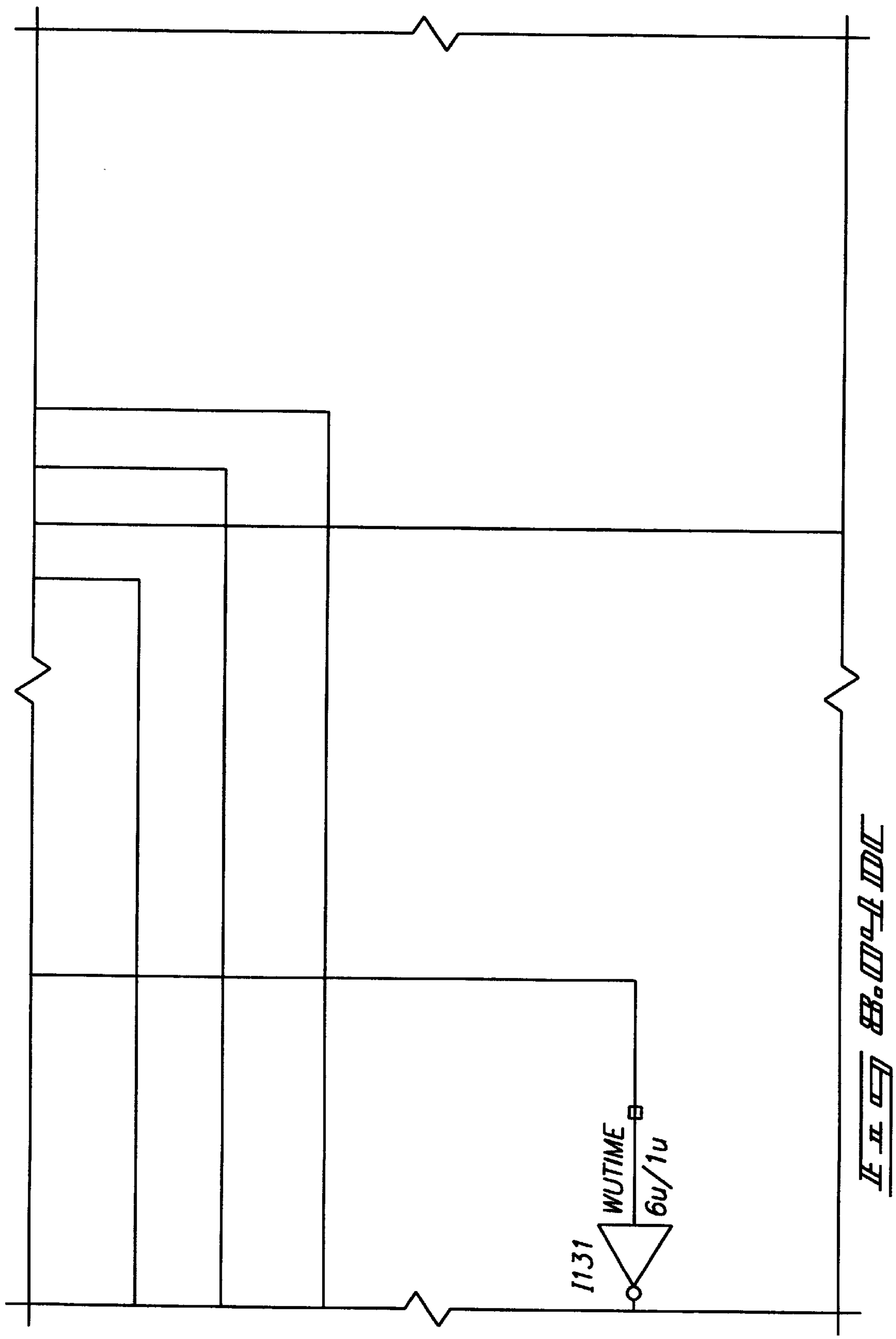
Fig. 8.04DC

Note: could use pnlock if pnlockdet were enabled by SDD. Then check freqlock after message is received to ensure good transmit clock.

FIG. 8.04DD

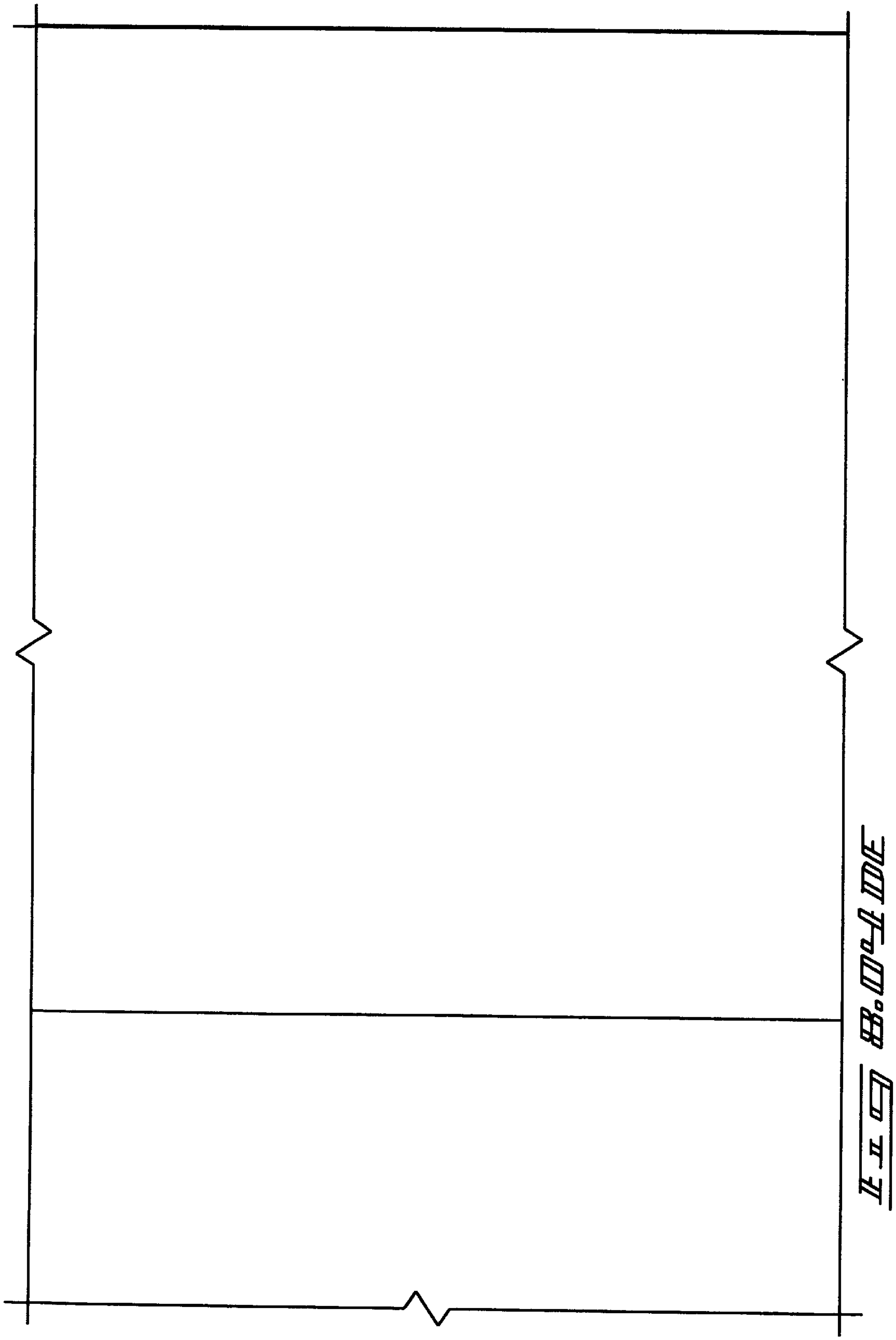
FIG. 8.04DE

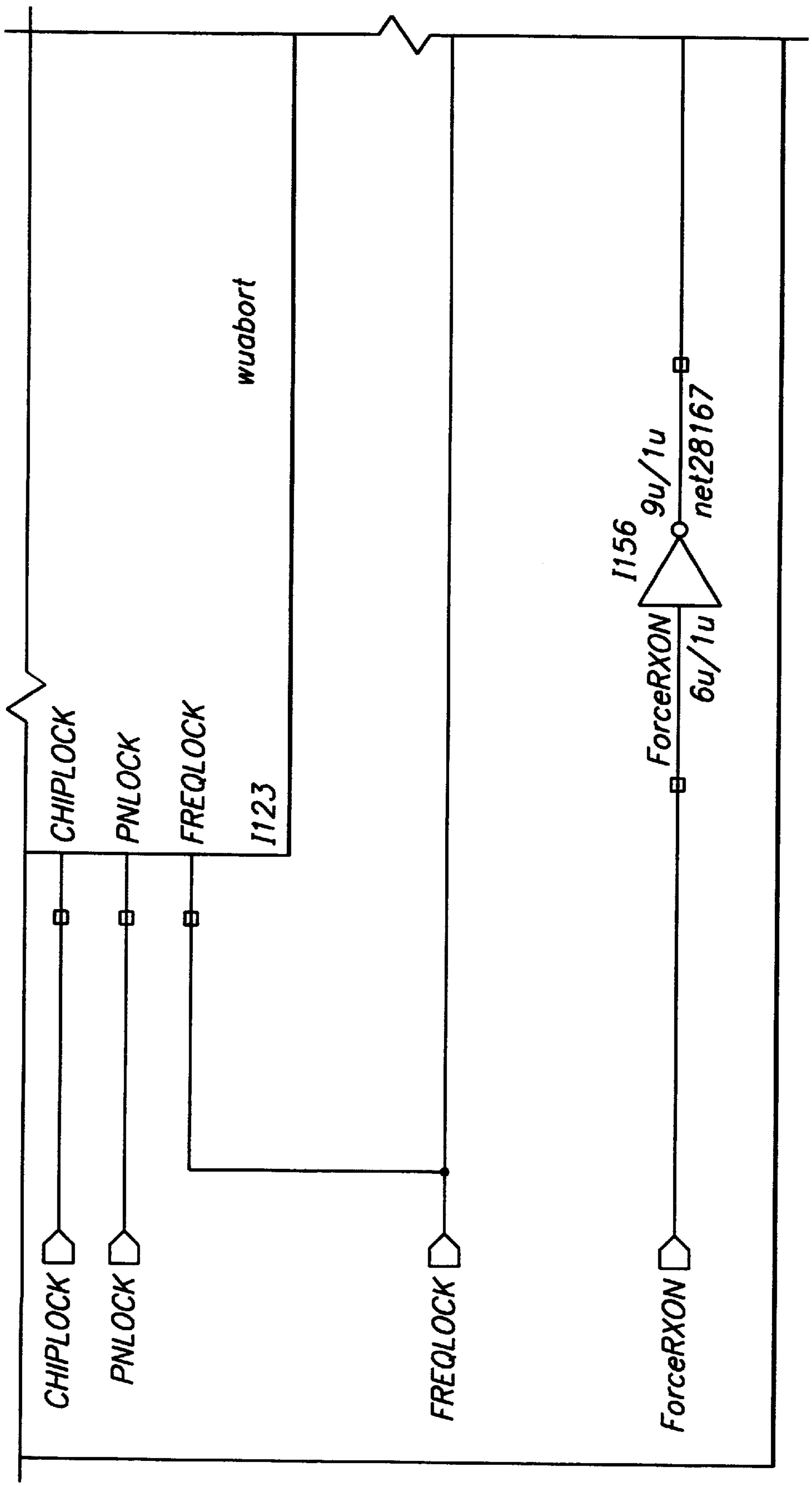
FIG. 8.04EA

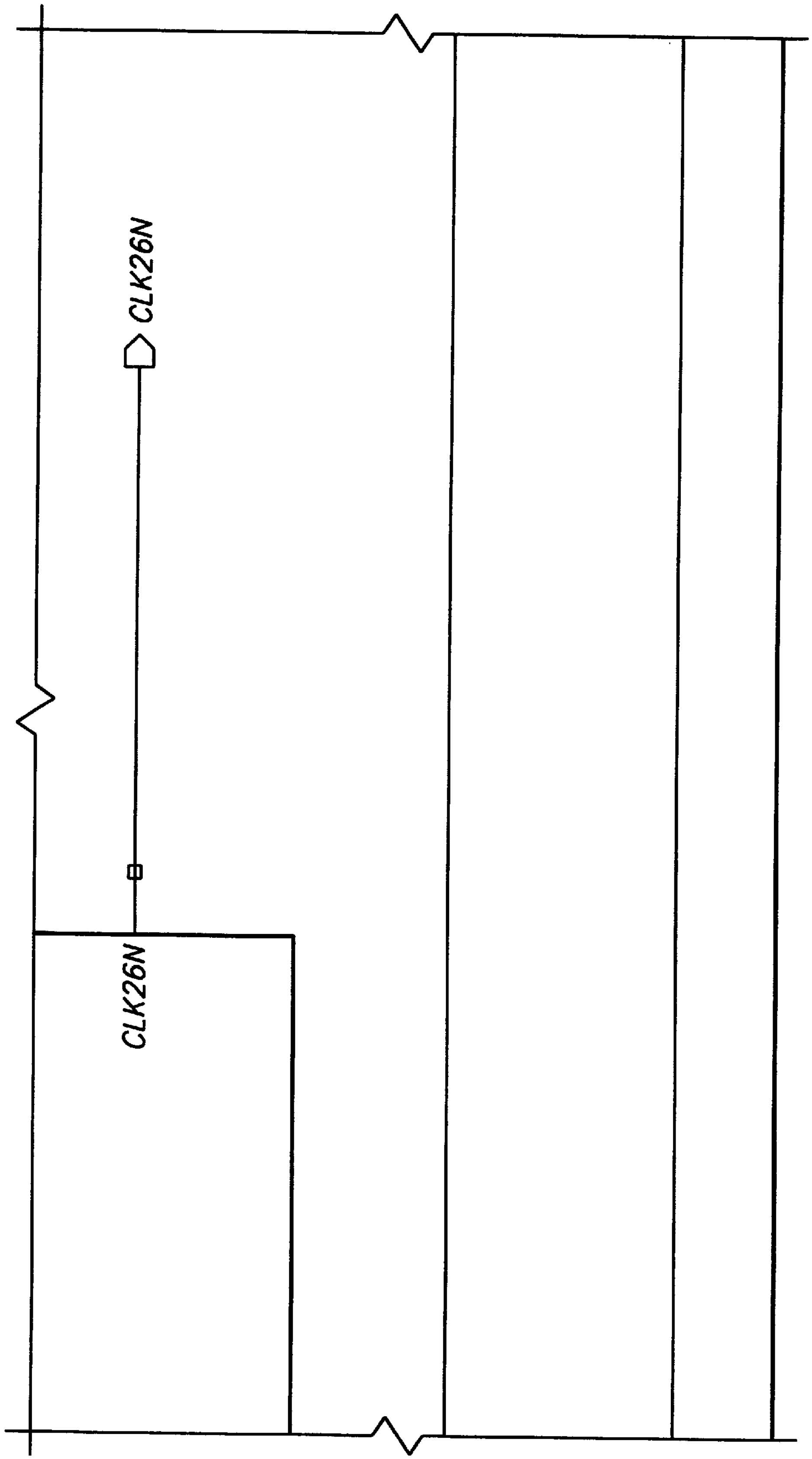
Fig. 8.04EB

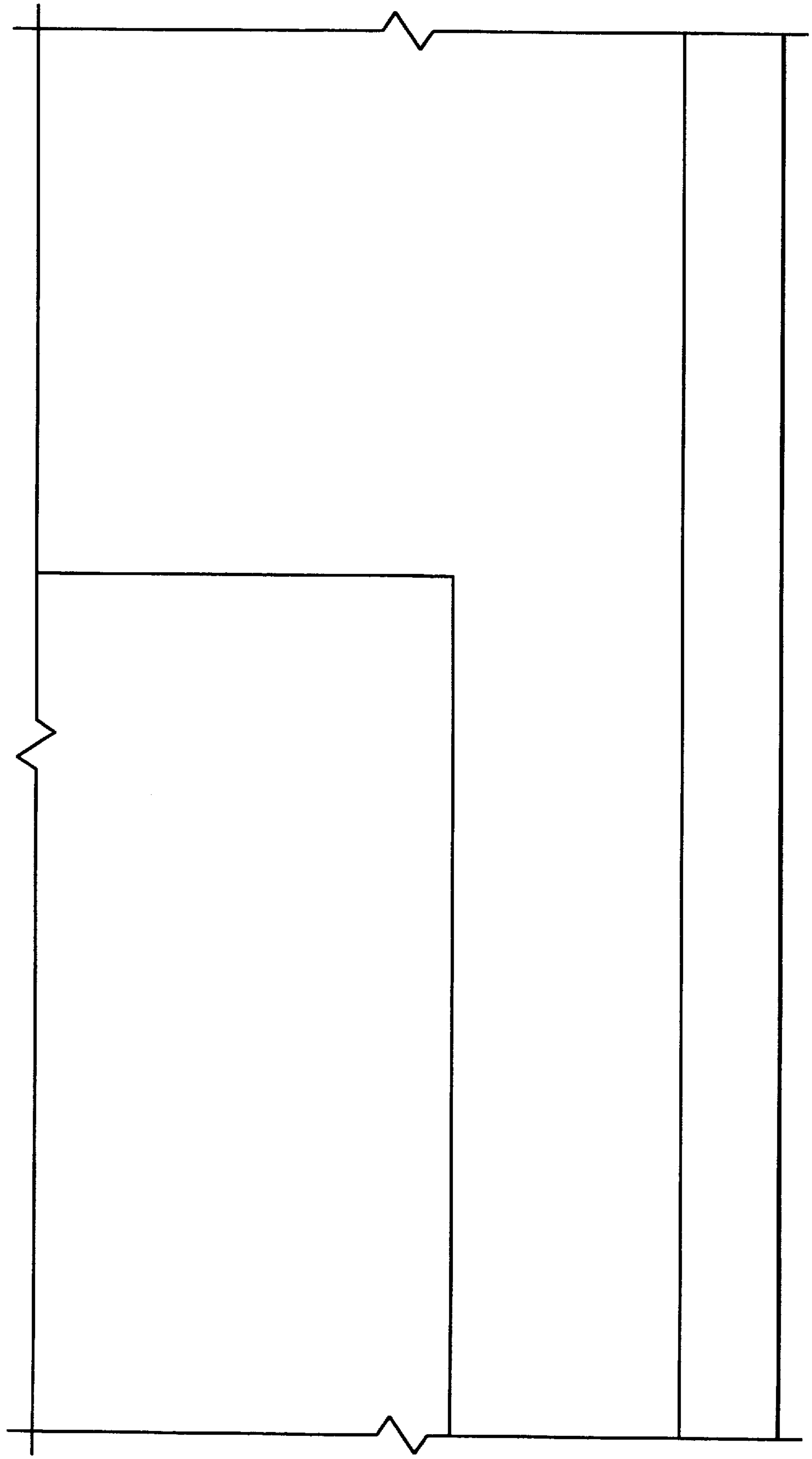
Fig. 8.04EC

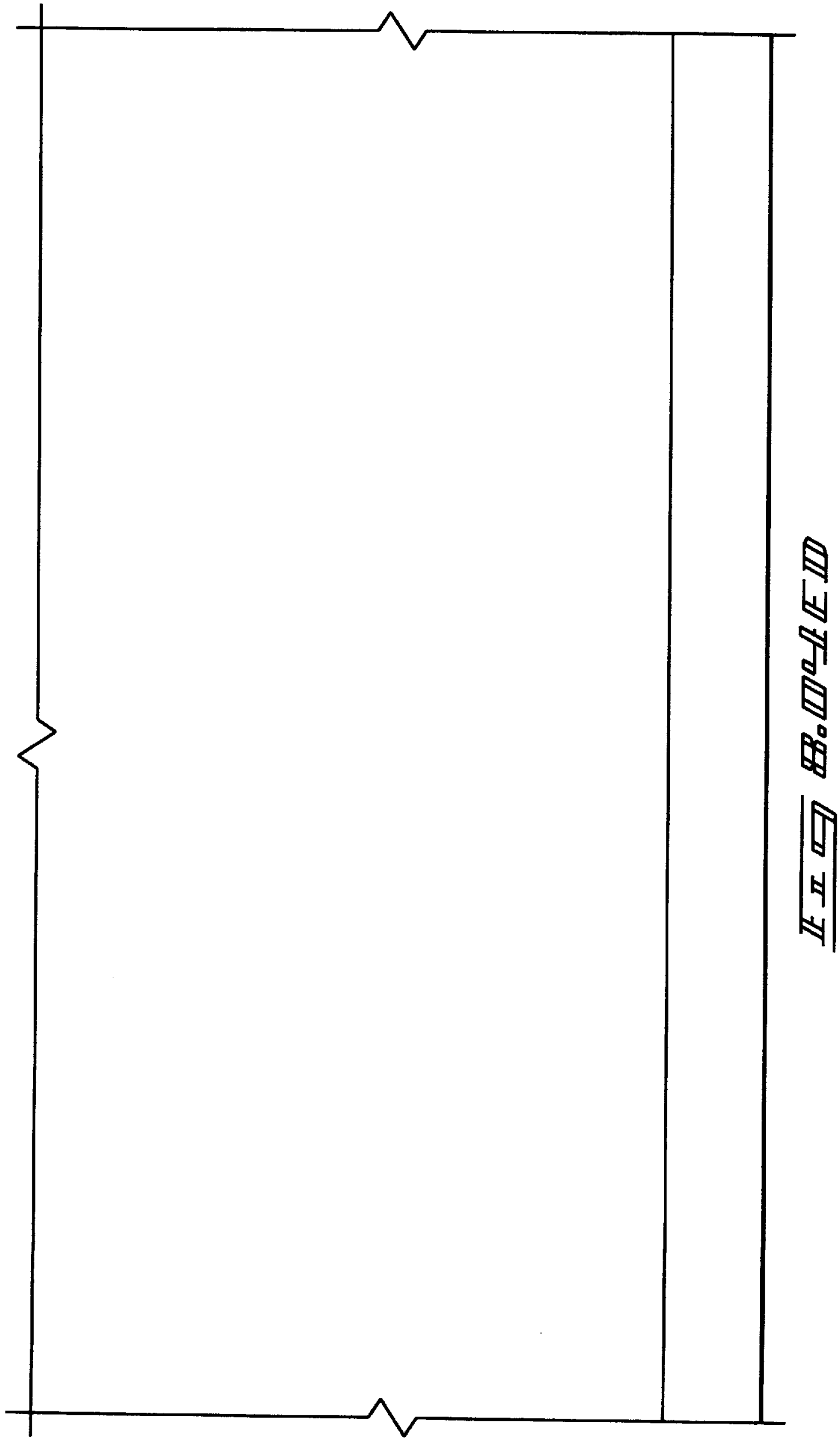
Fig. 8.04ED

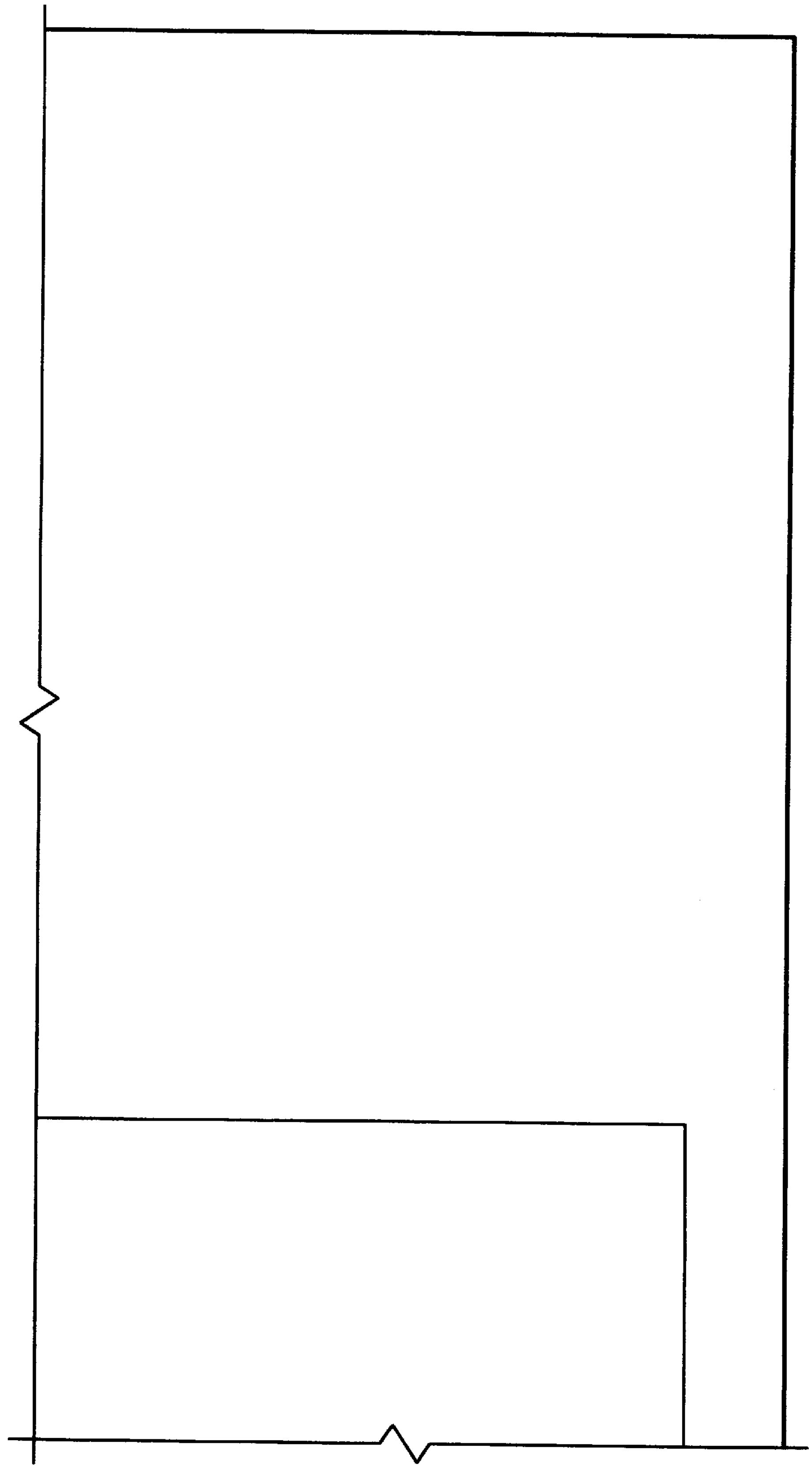
Fig. 8.04EE

| | | | | |
|---|---|---|---|---|
| 8.0401AA | 8.0401AB | 8.0401AC | 8.0401AD | 8.0401AE |
| 8.0401BA | 8.0401BB | 8.0401BC | 8.0401BD | 8.0401BE |
| 8.0401CA | 8.0401CB | 8.0401CC | 8.0401CD | 8.0401CE |
| 8.0401DA | 8.0401DB | 8.0401DC | 8.0401DD | 8.0401DE |

Fig. 8.0401

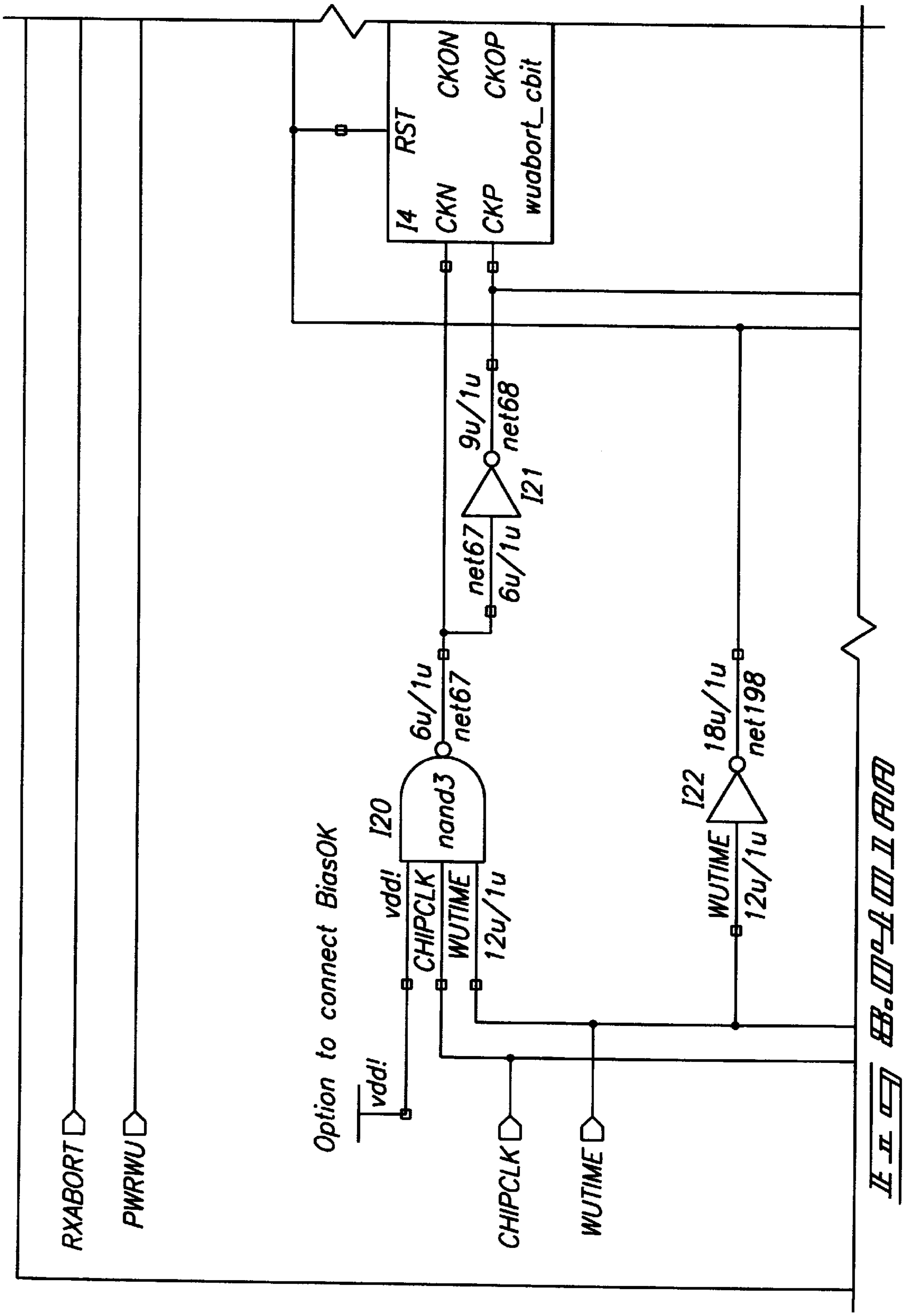
FIG. 8.DF.DII.AA

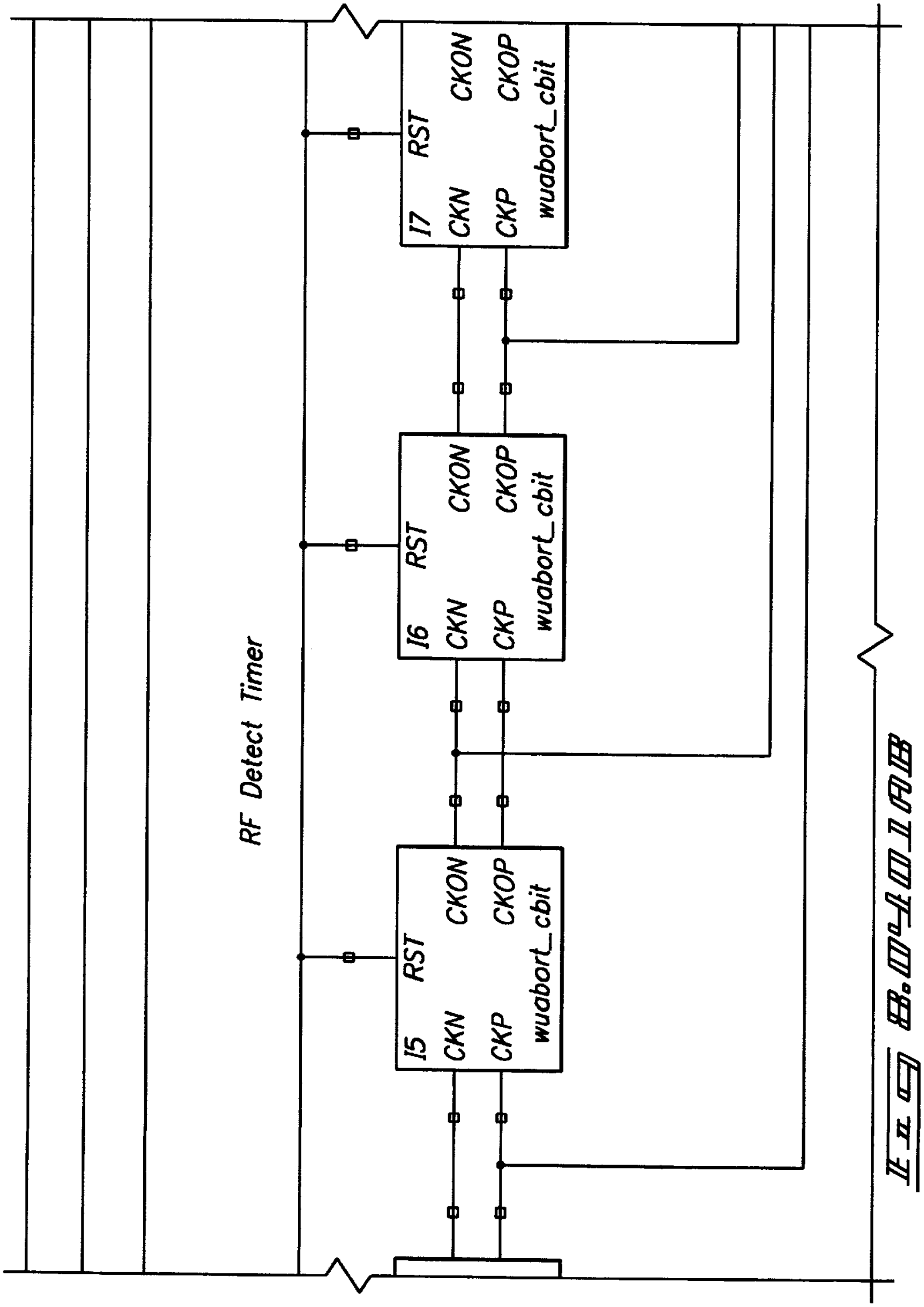
Fig. 8.0401AB

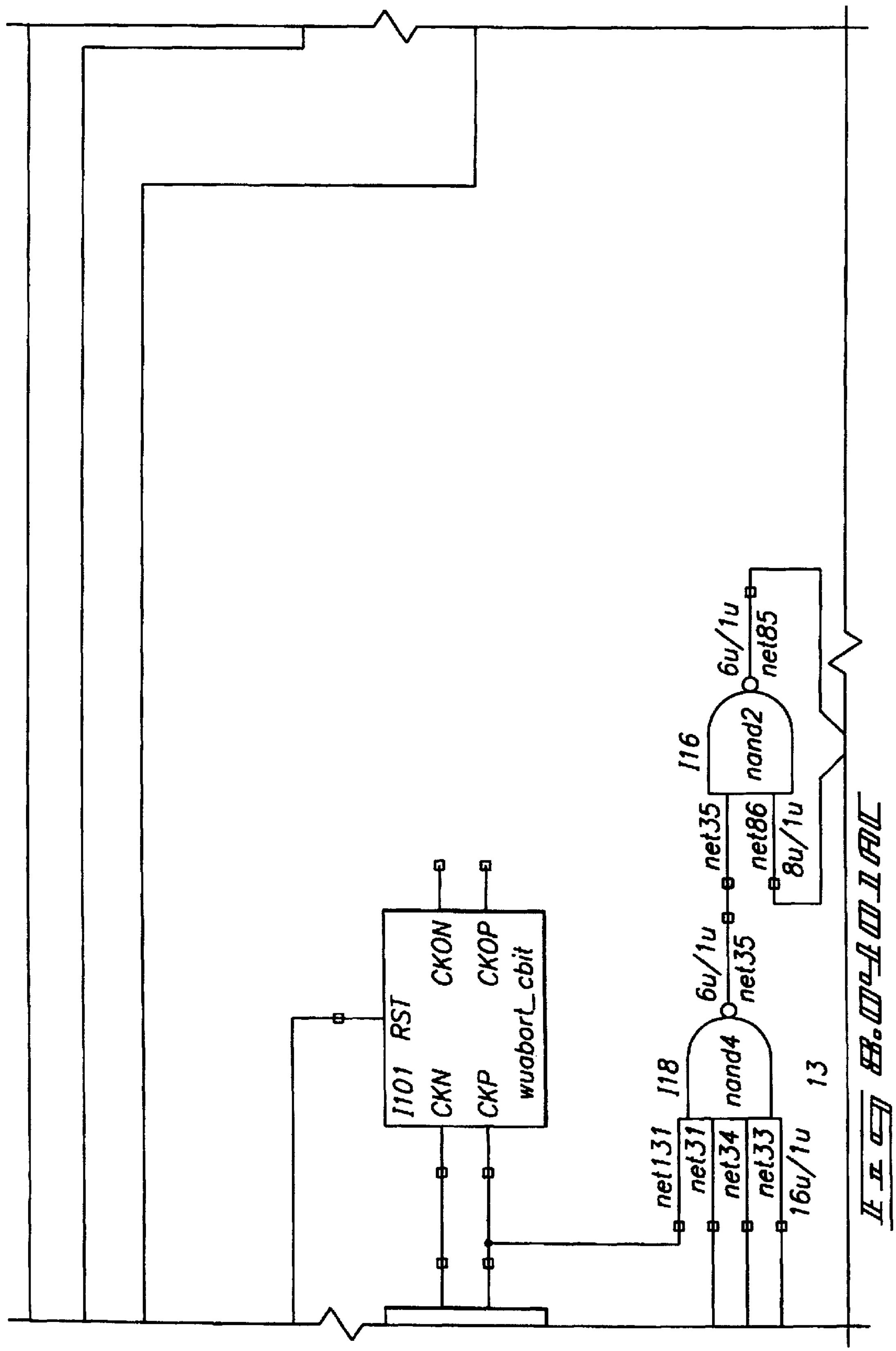
I101
CKN
CKP
wuabort_cbit
RST
CKON
CKOP
I18
nand4
6u/1u
net35
I16
nand2
net85
net86
8u/1u
net131
net31
net34
net33
16u/1u
I3

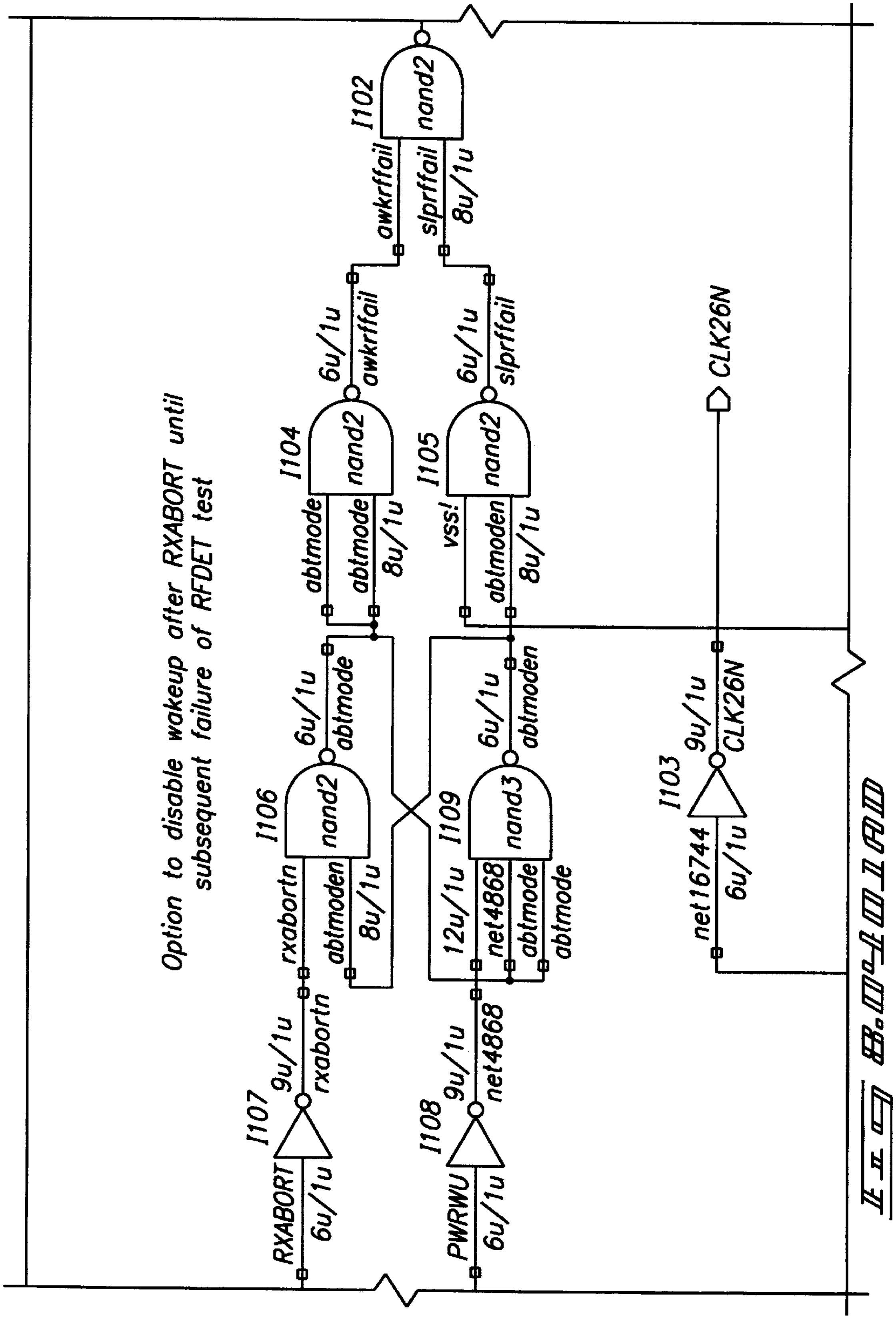
Option to disable wakeup after RXABORT until
subsequent failure of RFDET test
I102
nand2
awkrffail
slprffail
8u/1u
I104
nand2
6u/1u
awkrffail
abtmode
abtmode
8u/1u
I105
nand2
6u/1u
slprffail
vss!
abtmoden
8u/1u
CLK26N
I106
nand2
6u/1u
abtmode
rxabortn
abtmoden
8u/1u
I109
nand3
6u/1u
abtmoden
12u/1u
net4868
abtmode
abtmode
I103
9u/1u
CLK26N
net16744
6u/1u
I107
9u/1u
rxabortn
RXABORT
6u/1u
I108
9u/1u
net4868
PWRWU
6u/1u

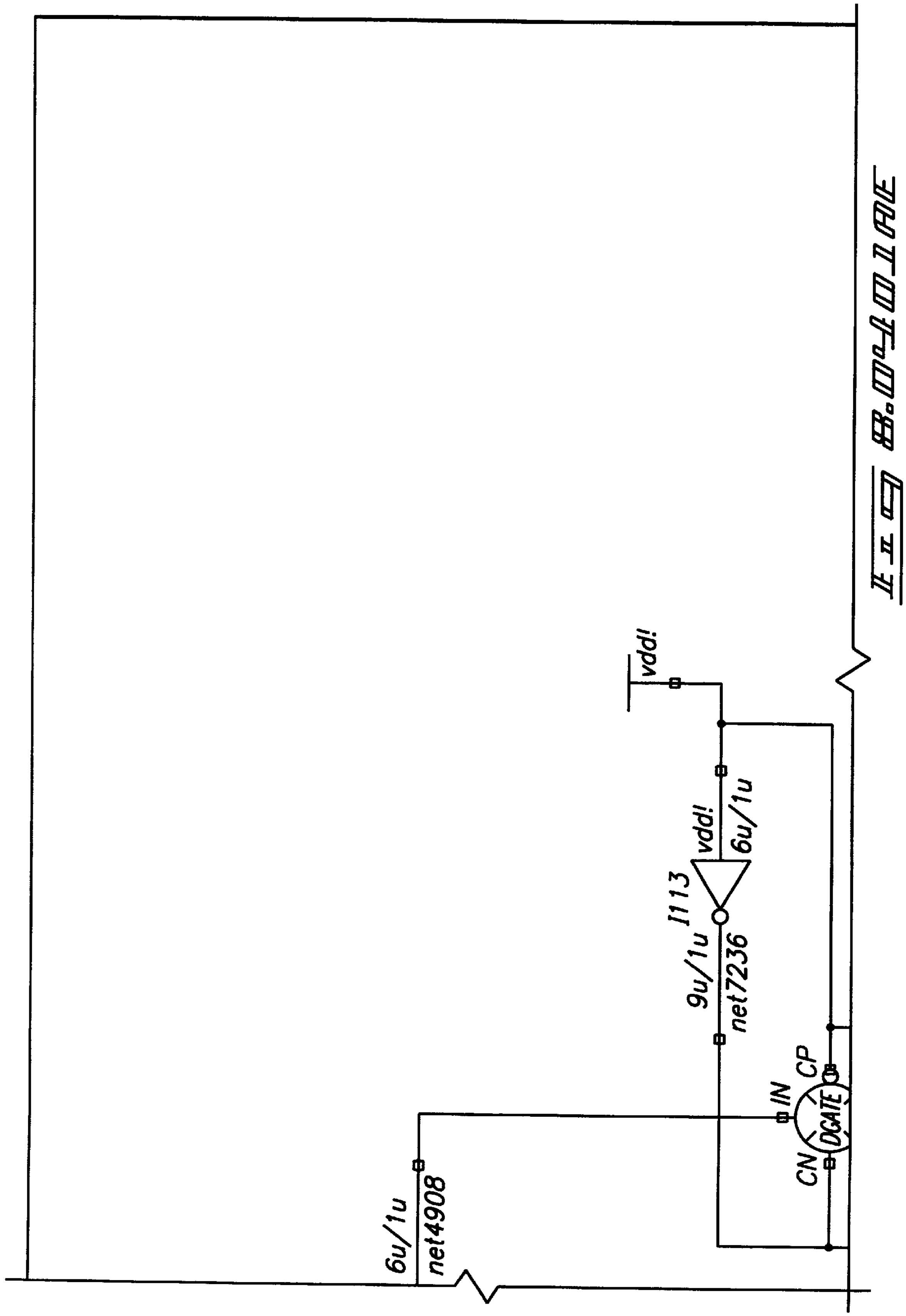
Fig. 8.0401AE

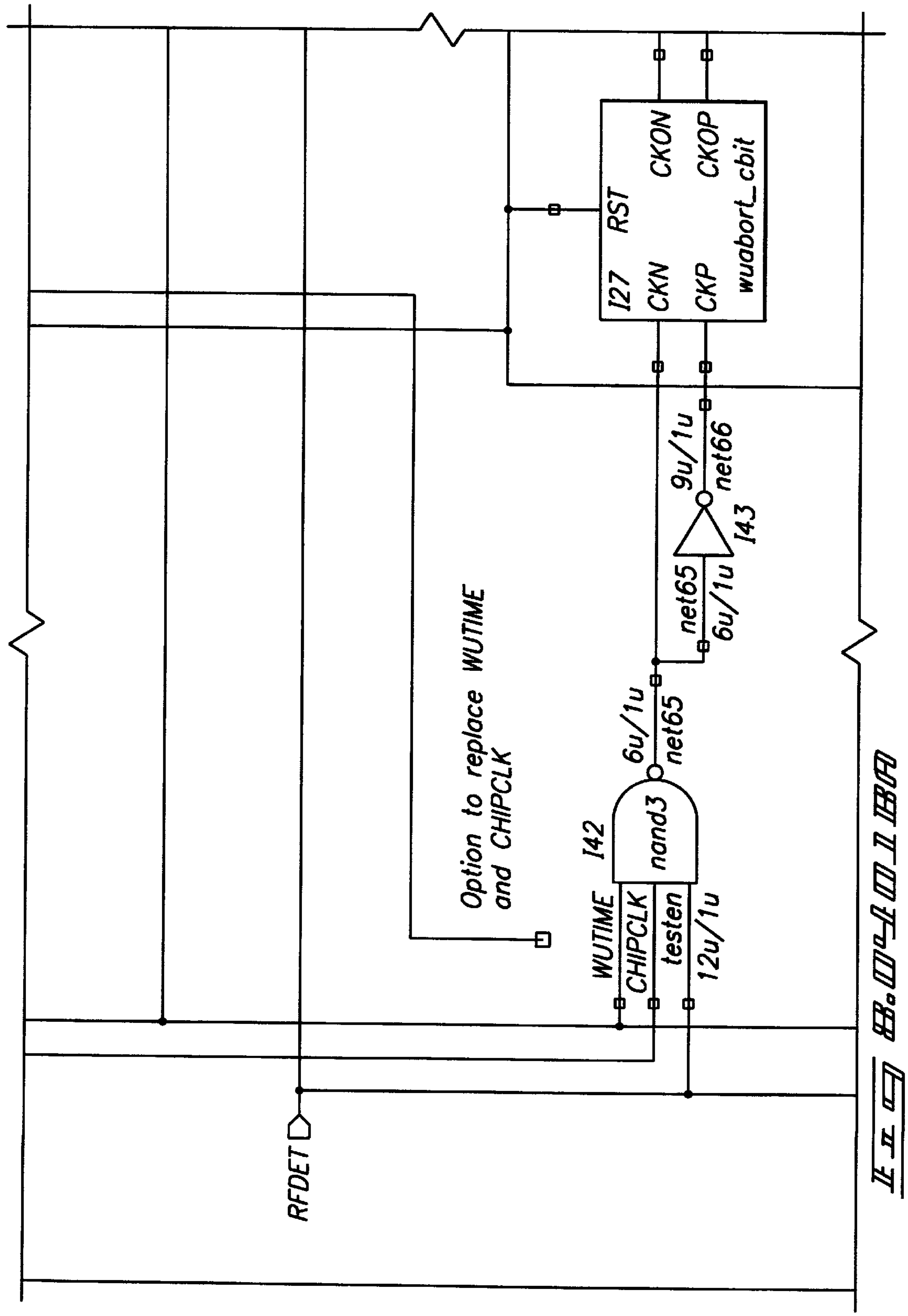
Fig. 8.04-10BA

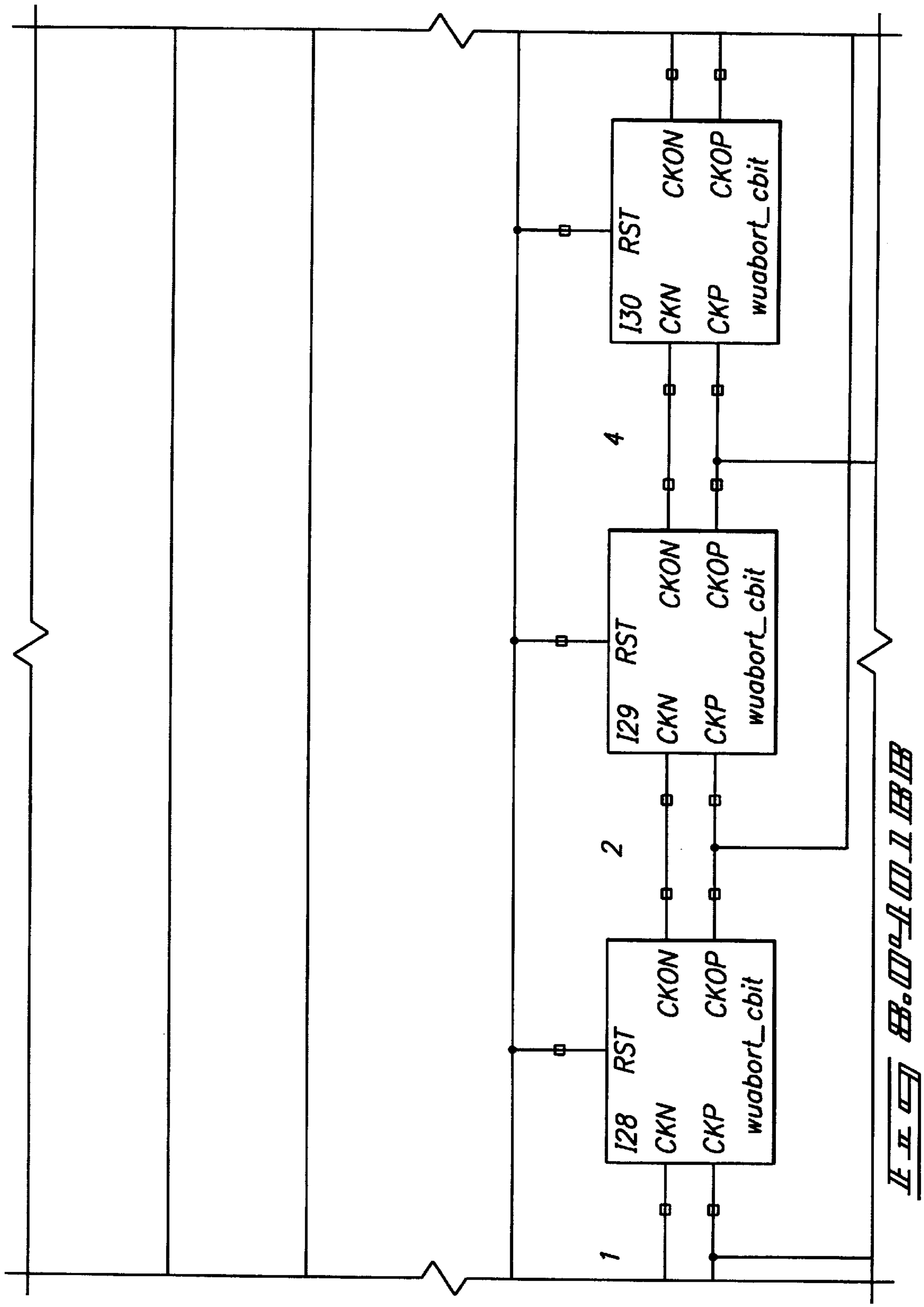
Fig. 8.0401BB

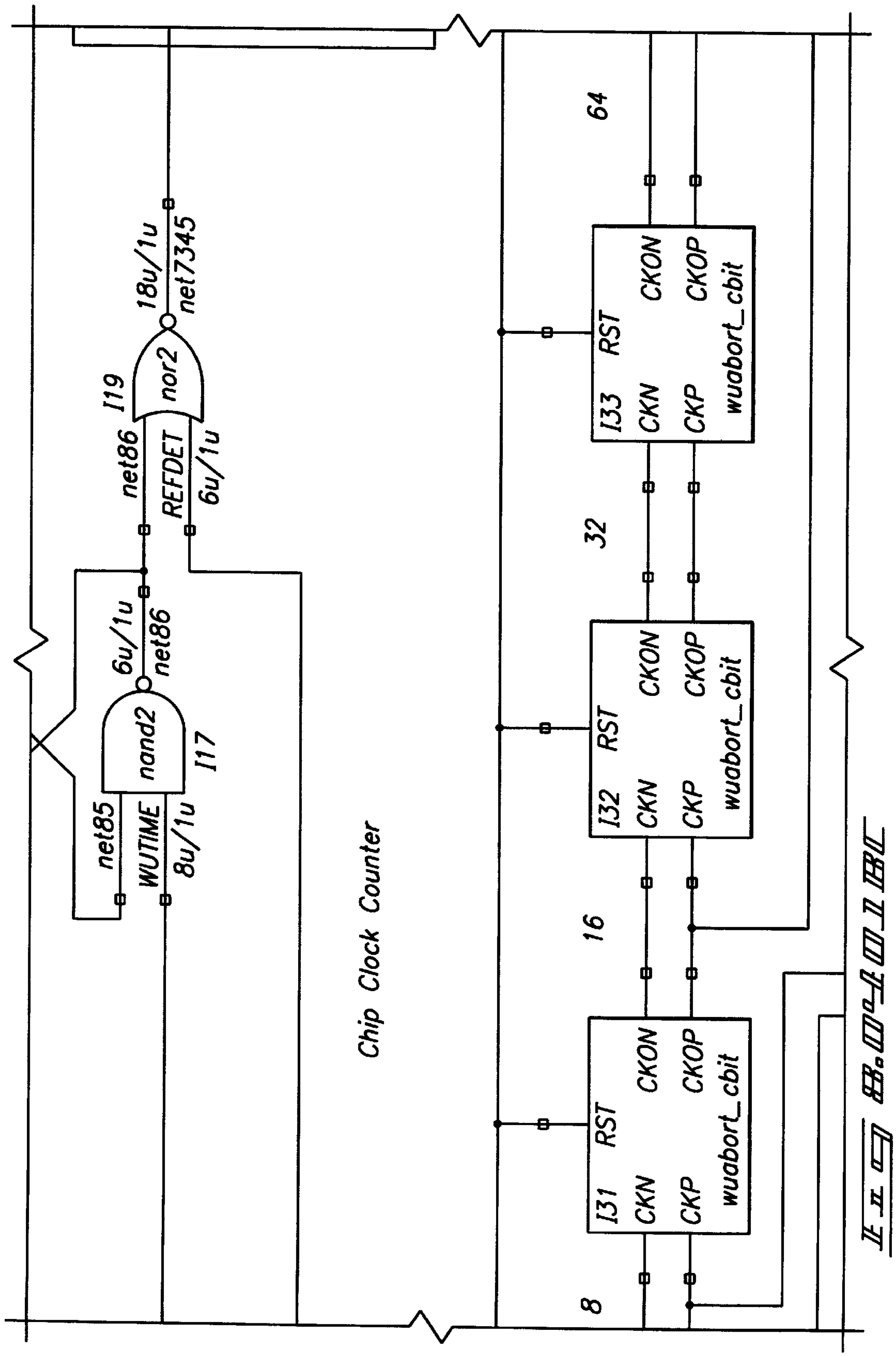
18u/1u
net7345
I19
nor2
net86
REFDET
6u/1u
6u/1u
net86
nand2
I17
net85
WUTIME
8u/1u
Chip Clock Counter
64
32
16
8
I33
I32
I31
RST
CKN
CKP
CKON
CKOP
wuabort_cbit

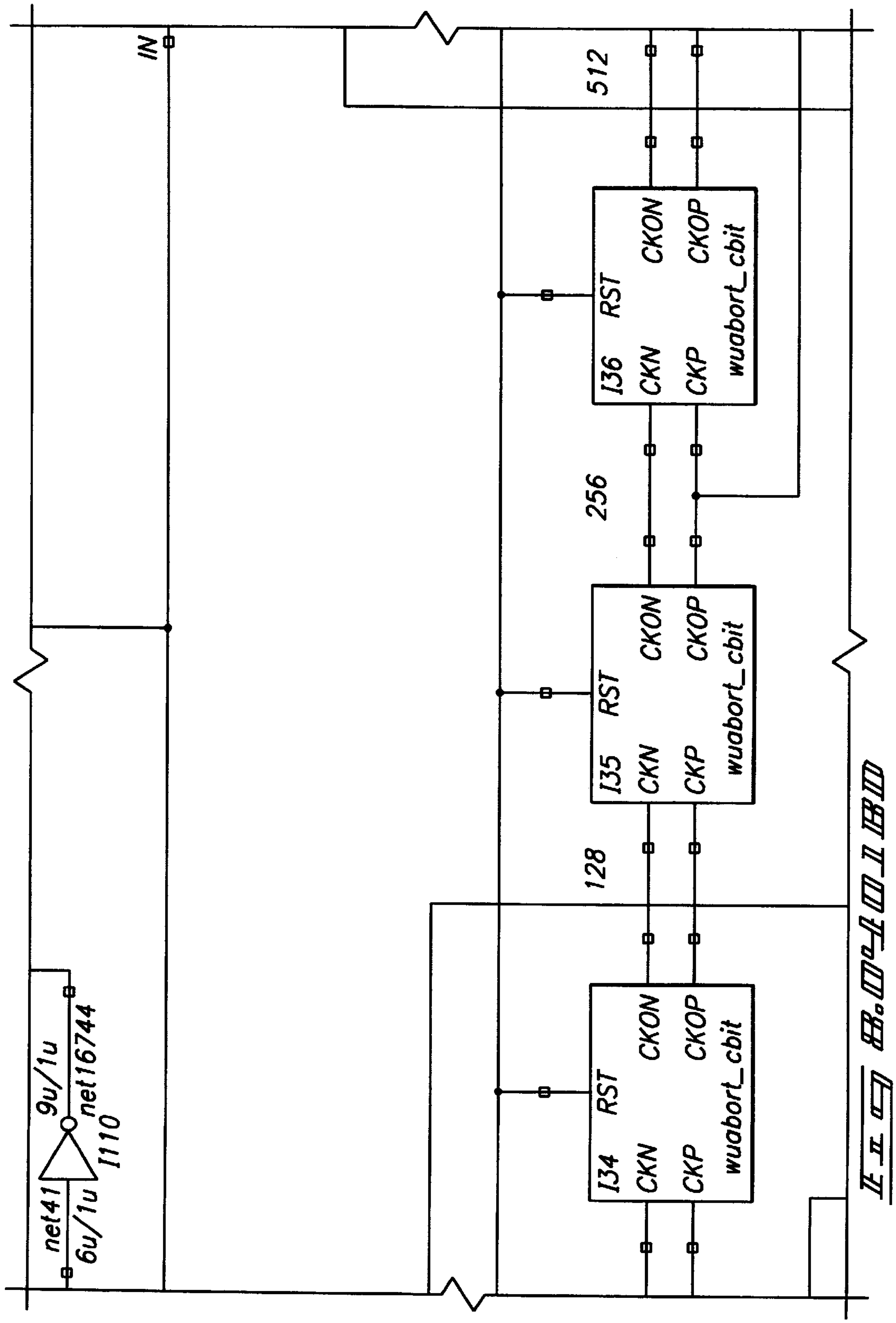
IN
512
256
128
I36
I35
I34
CKN
CKP
RST
CKON
CKOP
wuabort_cbit
net41
6u/1u
9u/1u
net16744
I110

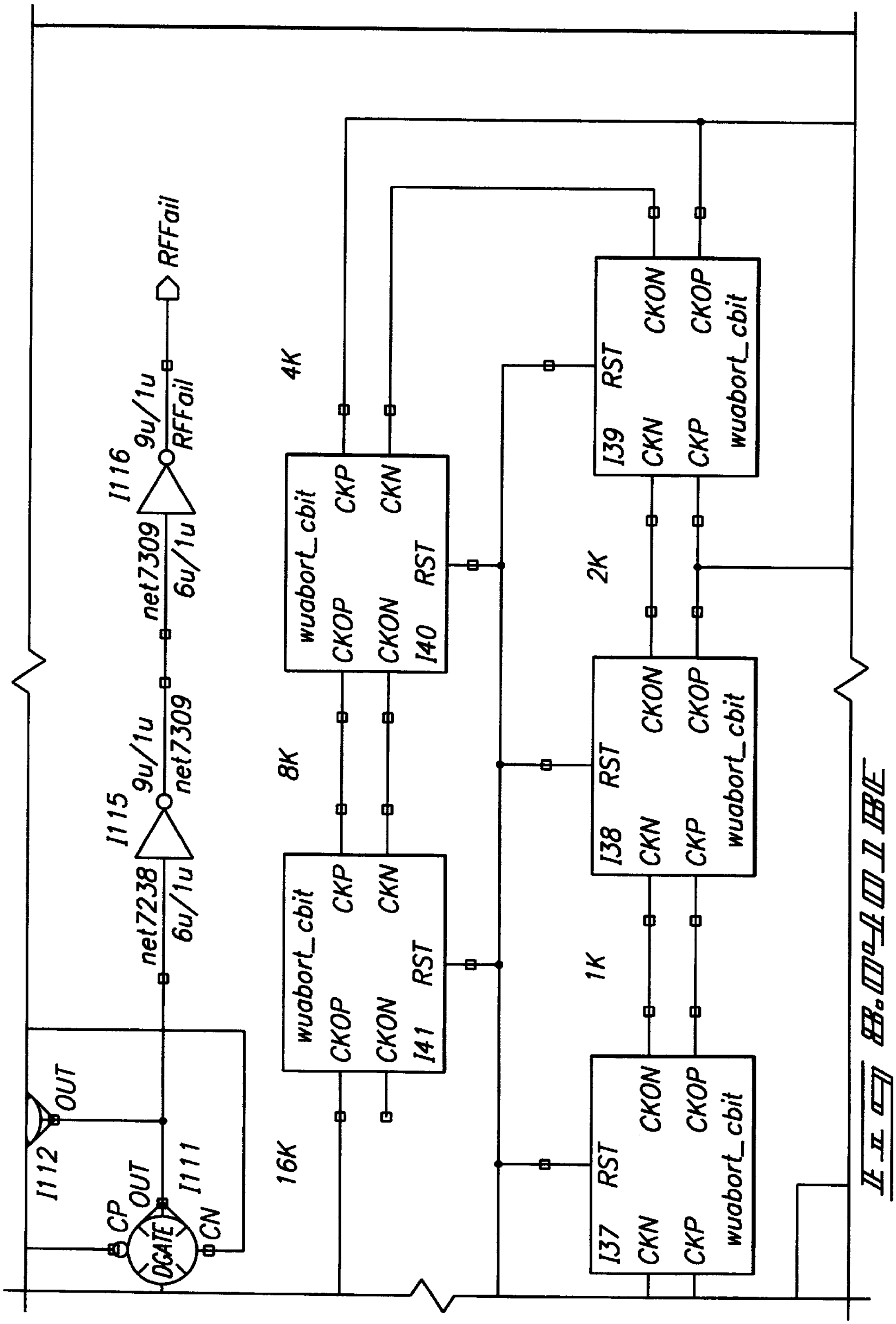
FIG. 8.041BE

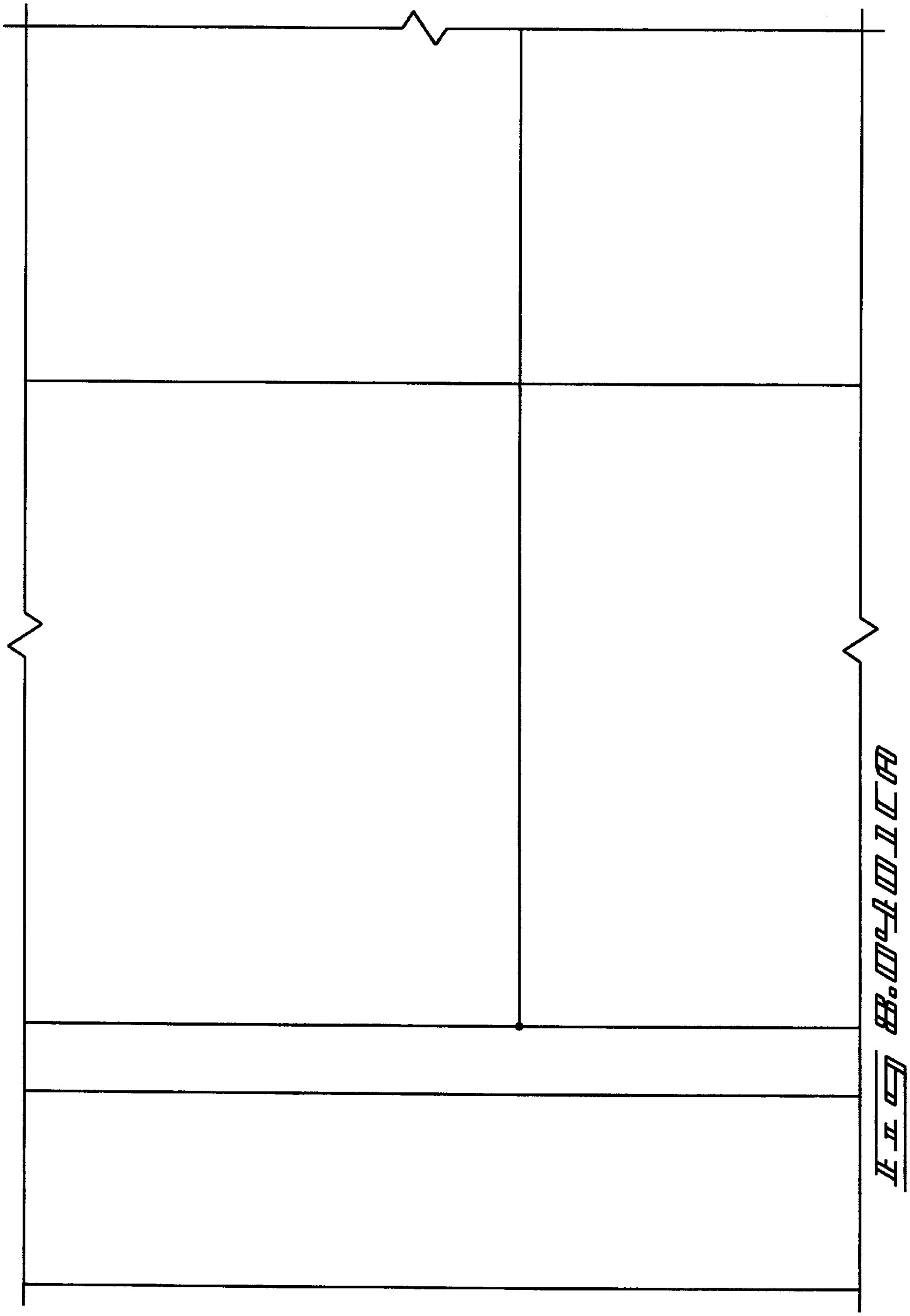
Fig. 8.0401CA

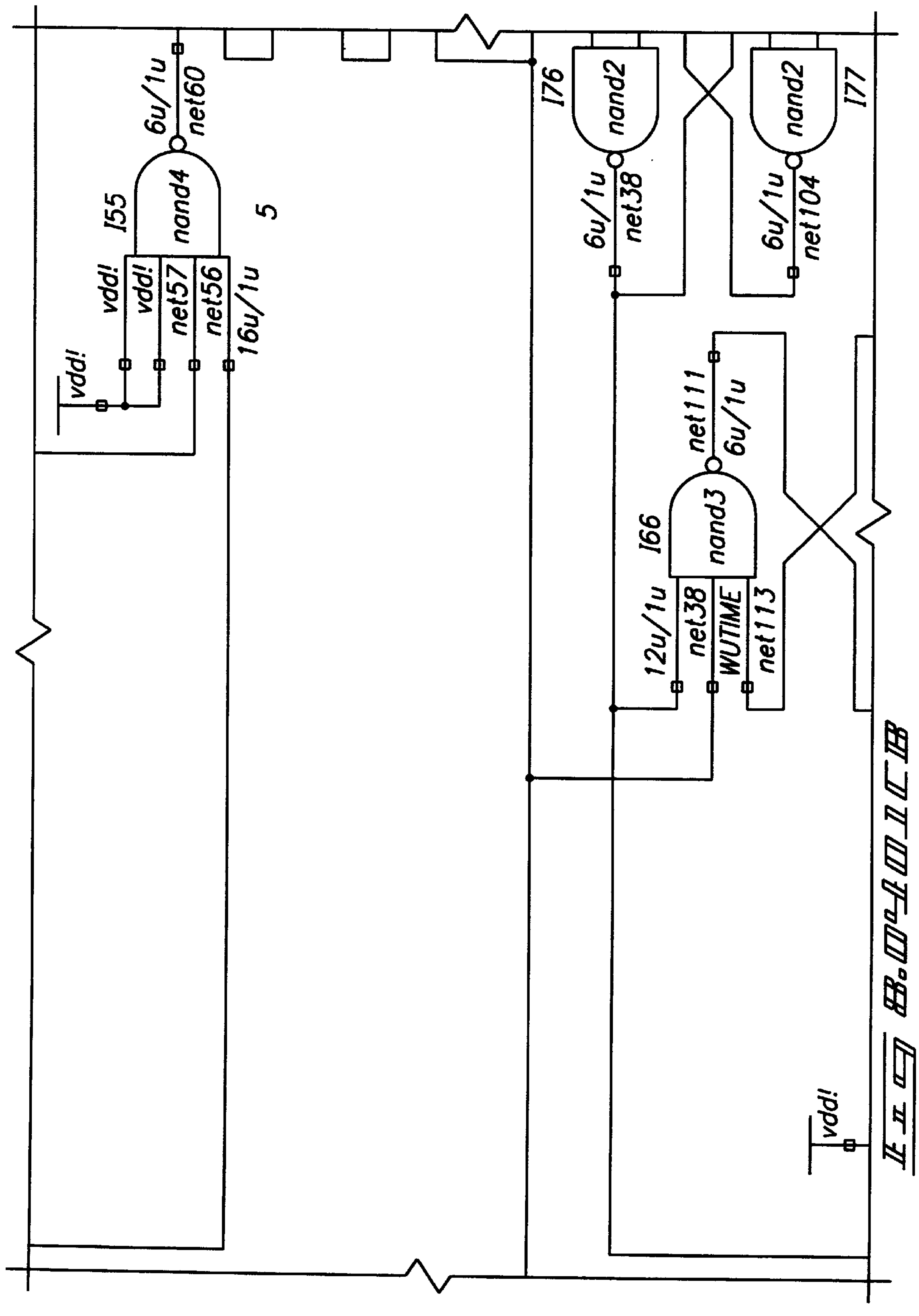
vdd!
vdd!
vdd!
net57
net56
16u/1u
I55
nand4
5
6u/1u
net60
I76
nand2
6u/1u
net38
nand2
I77
6u/1u
net104
net111
6u/1u
I66
nand3
12u/1u
net38
WUTIME
net113
vdd!

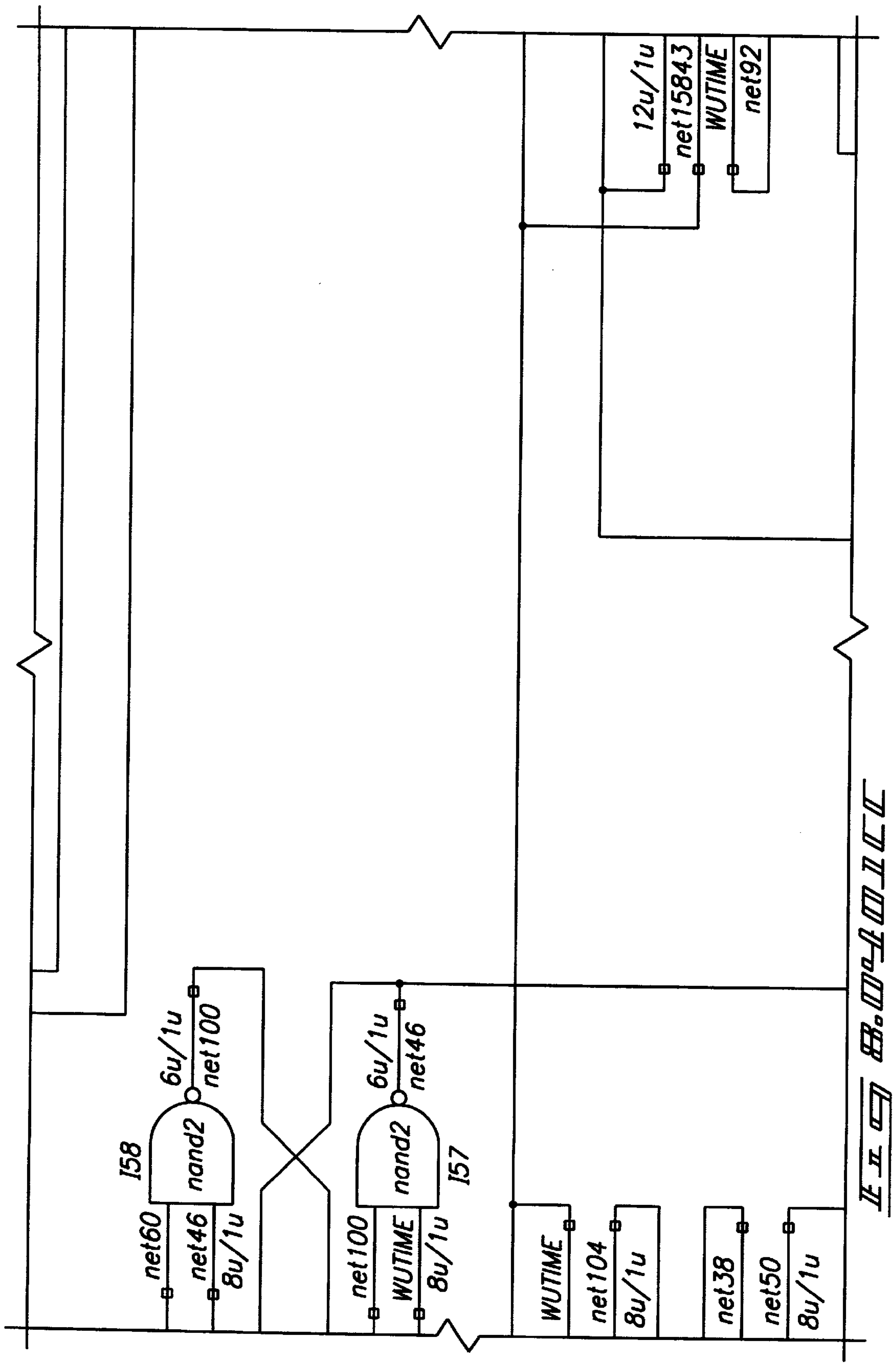
FIG. 8.040ICC

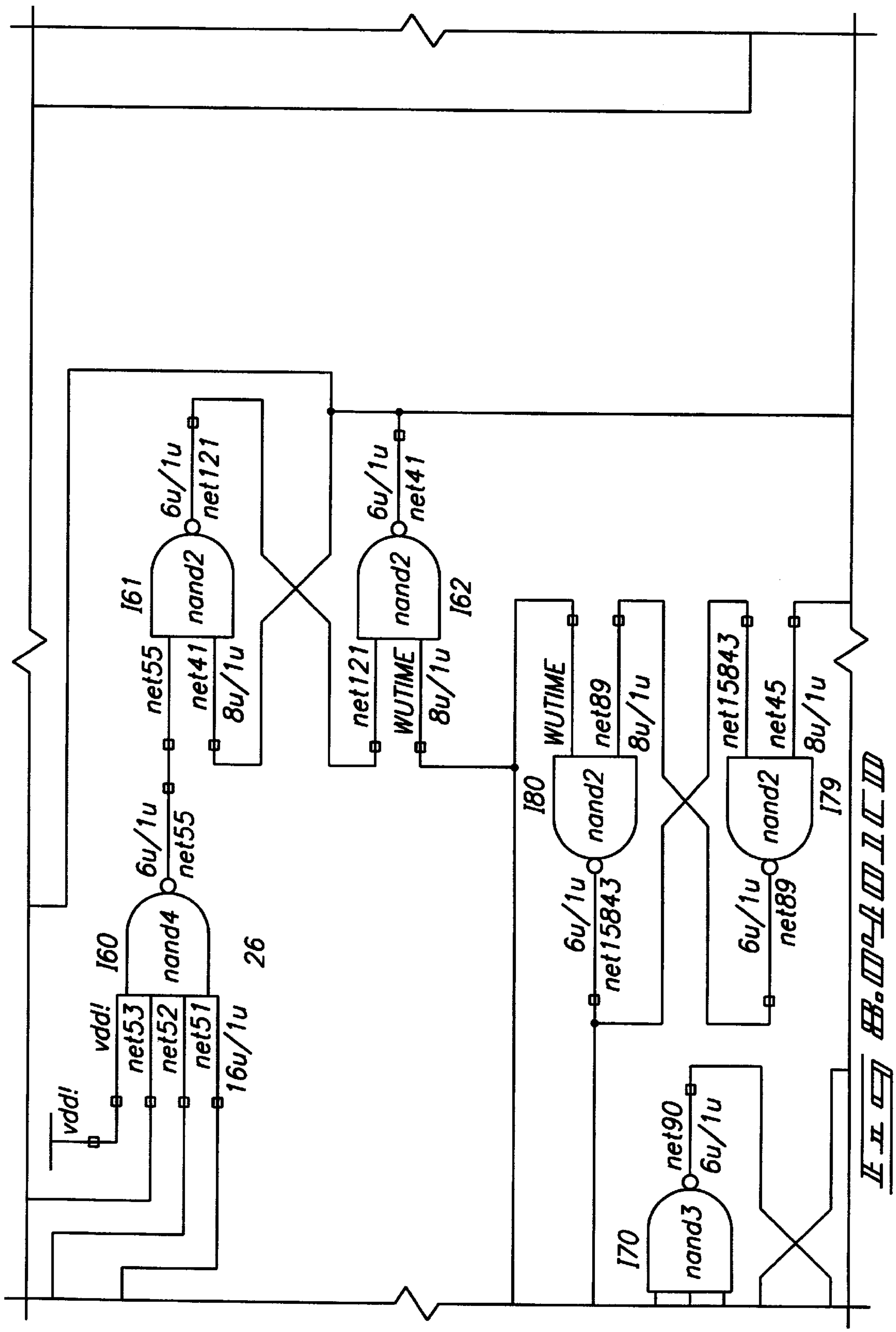
FIG. 8.004CD

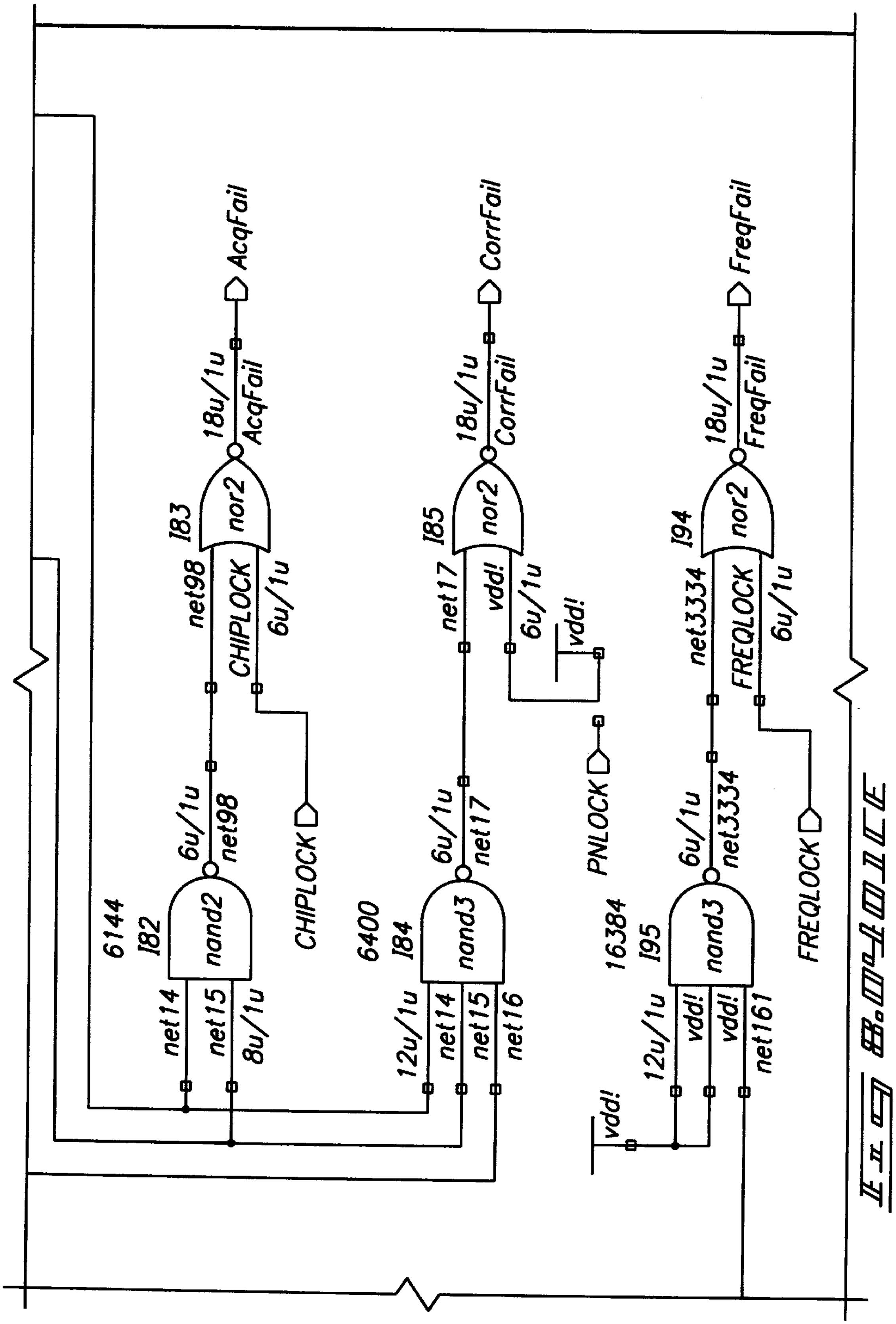
AcqFail
18u/1u
AcqFail
183
nor2
net98
CHIPLOCK
6u/1u
6u/1u
net98
6144
I82
nand2
CHIPLOCK
net14
net15
8u/1u
CorrFail
18u/1u
CorrFail
I85
nor2
net17
vdd!
6u/1u
vdd!
6u/1u
net17
6400
I84
nand3
12u/1u
net14
net15
net16
PNLOCK
FreqFail
18u/1u
FreqFail
I94
nor2
net3334
FREQLOCK
6u/1u
6u/1u
net3334
16384
I95
nand3
FREQLOCK
12u/1u
vdd!
vdd!
net161
vdd!

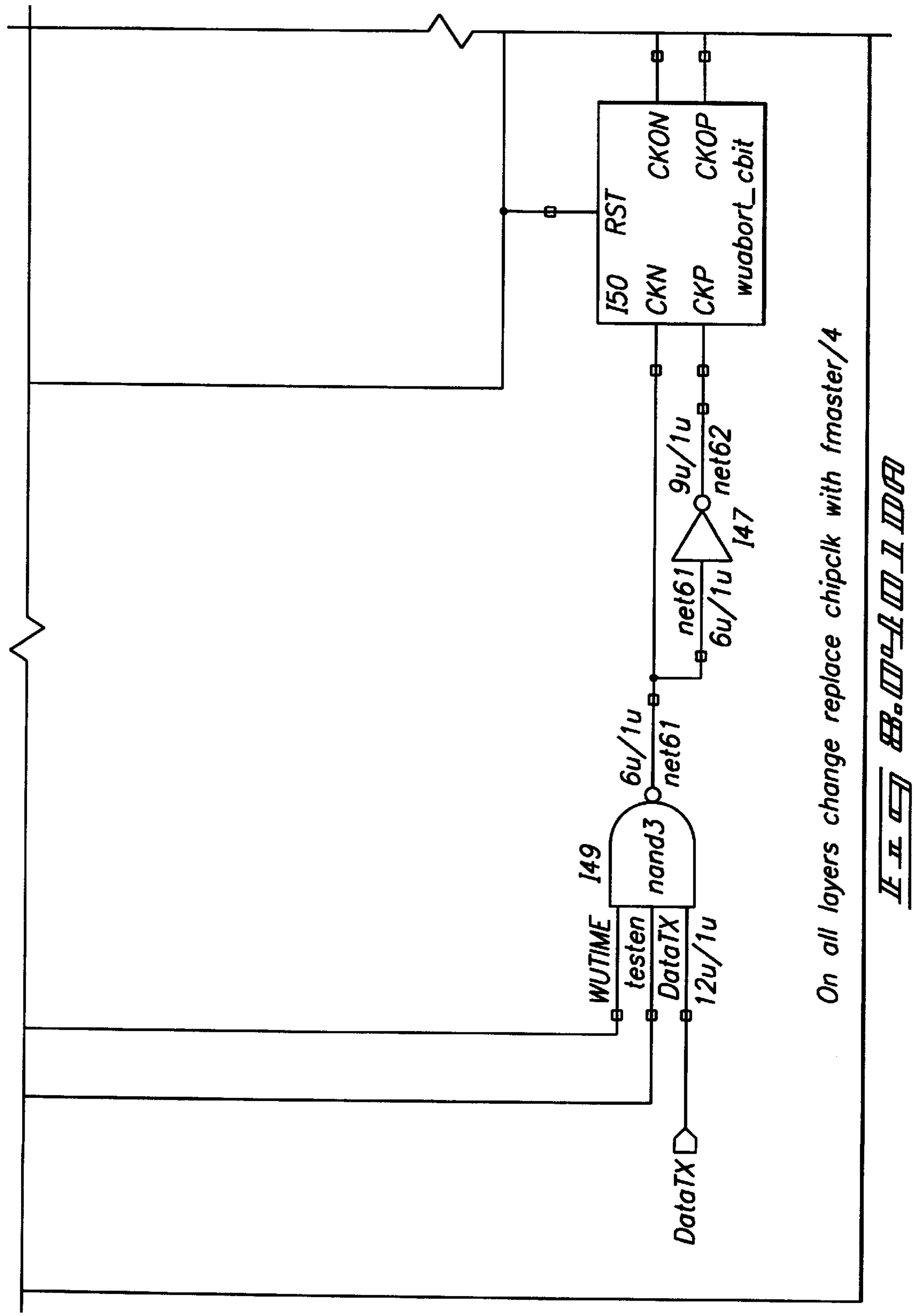
FIG. 8.0-401DA

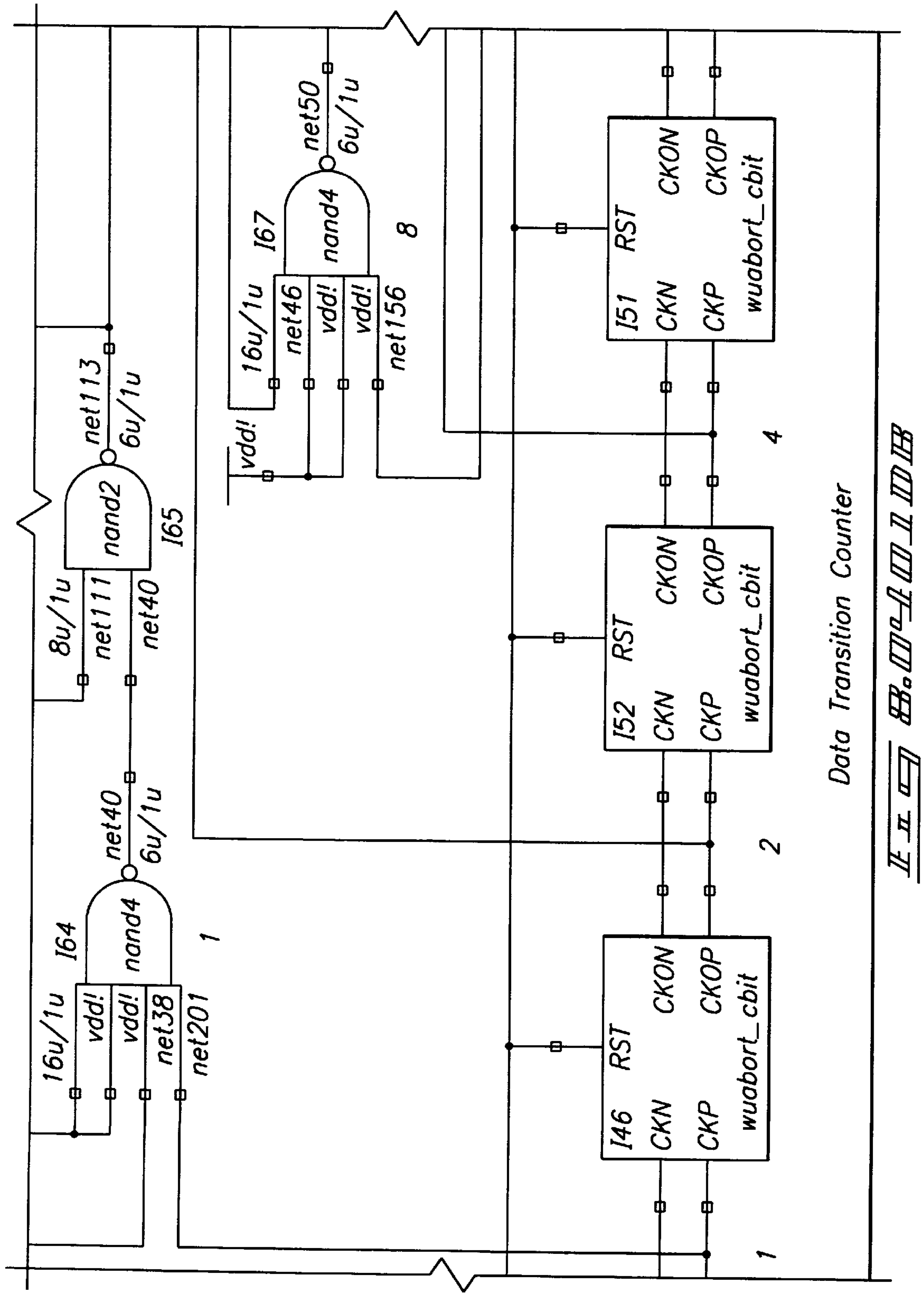
FIG. 8.0410B

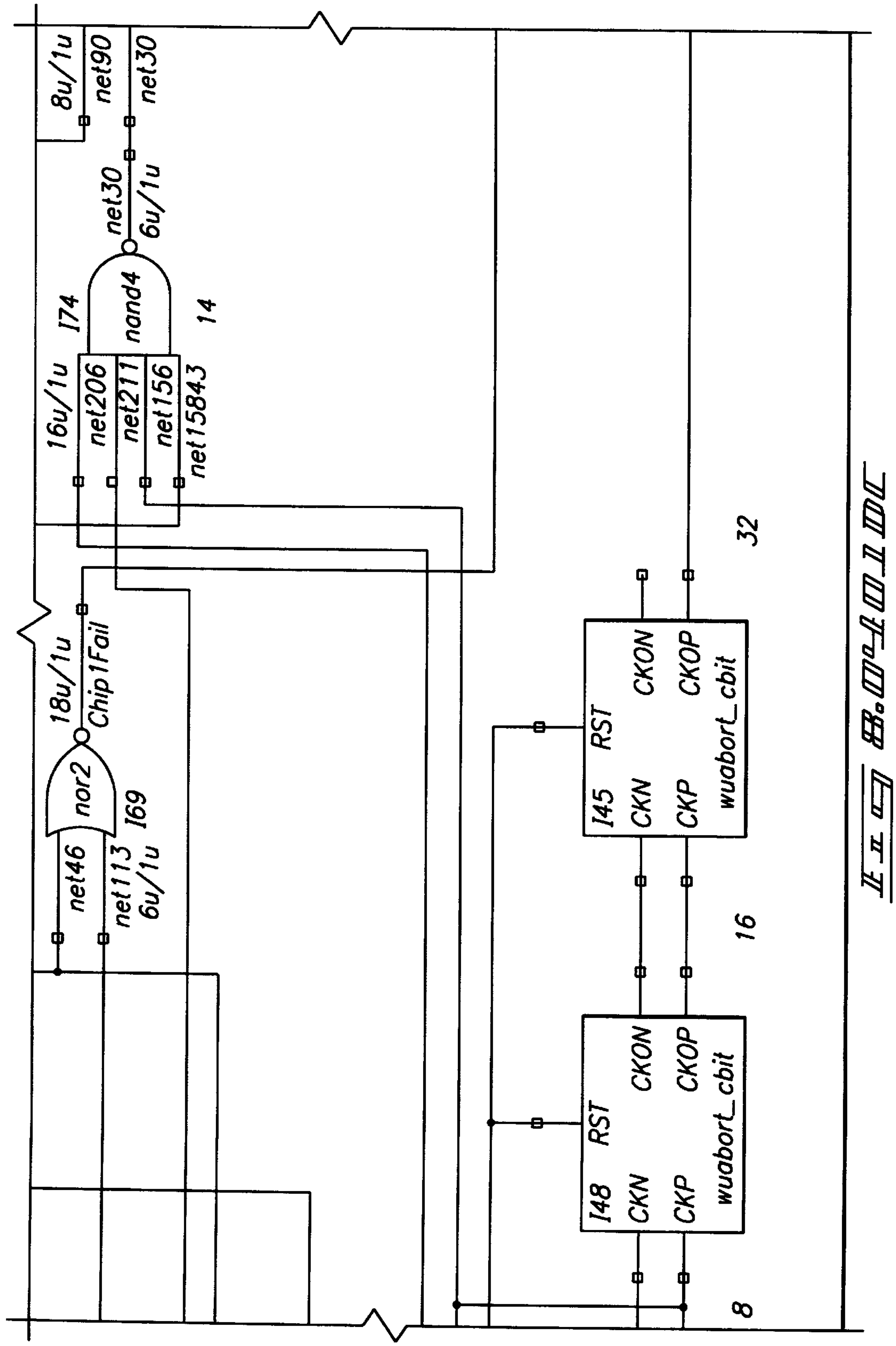
FIG. 8.04010C

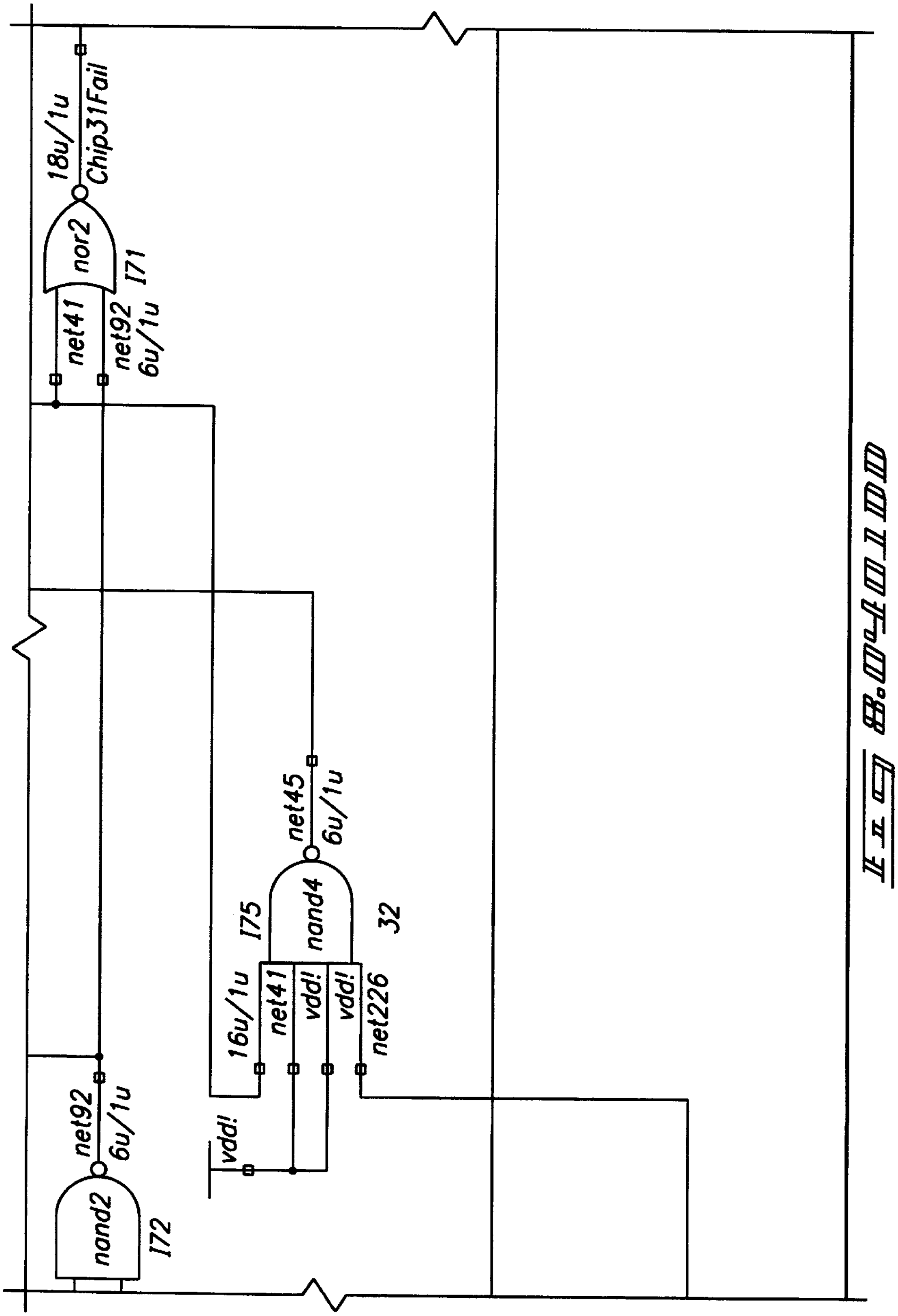
Fig. 8.04010D

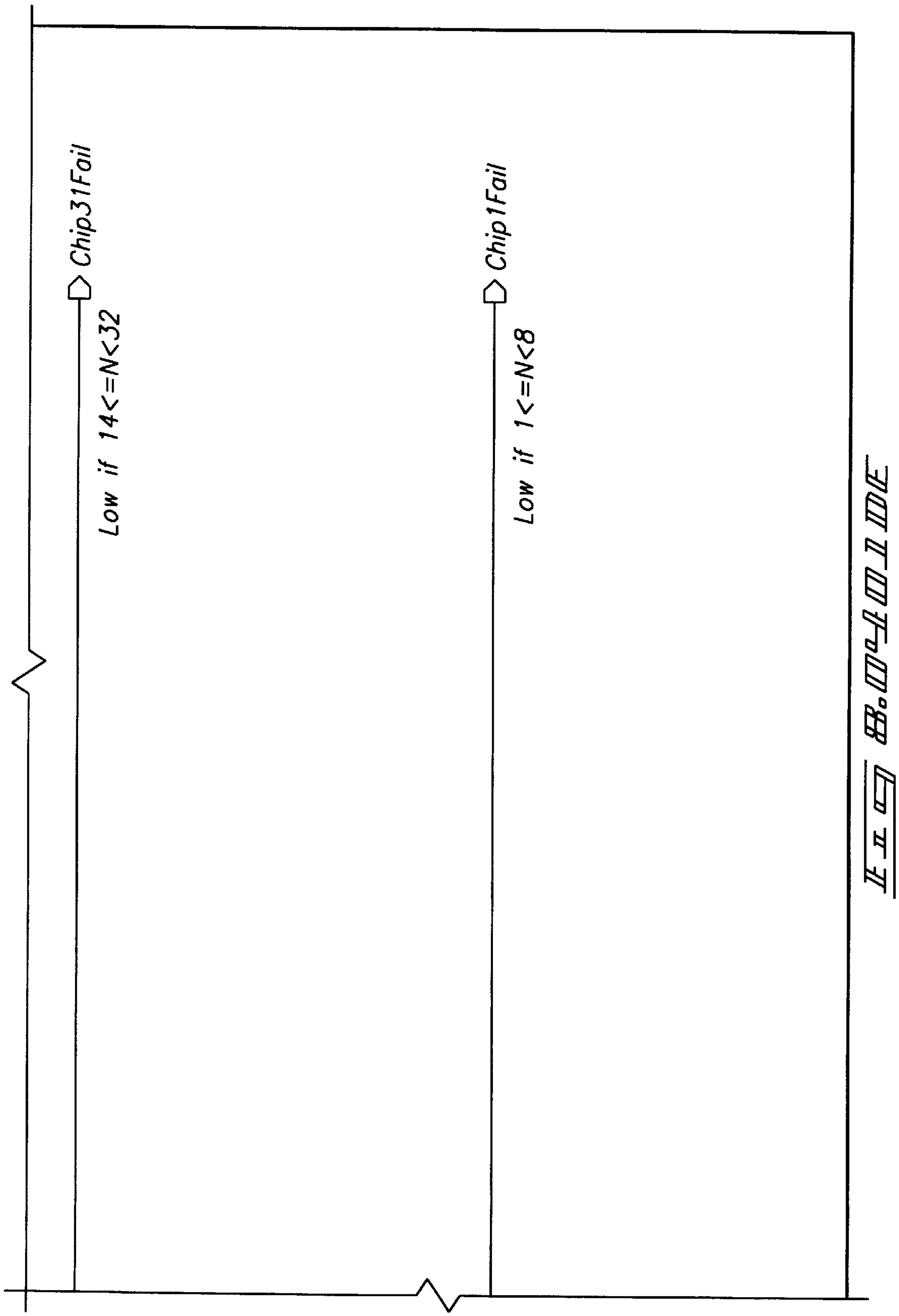
Fig 8.0401DE

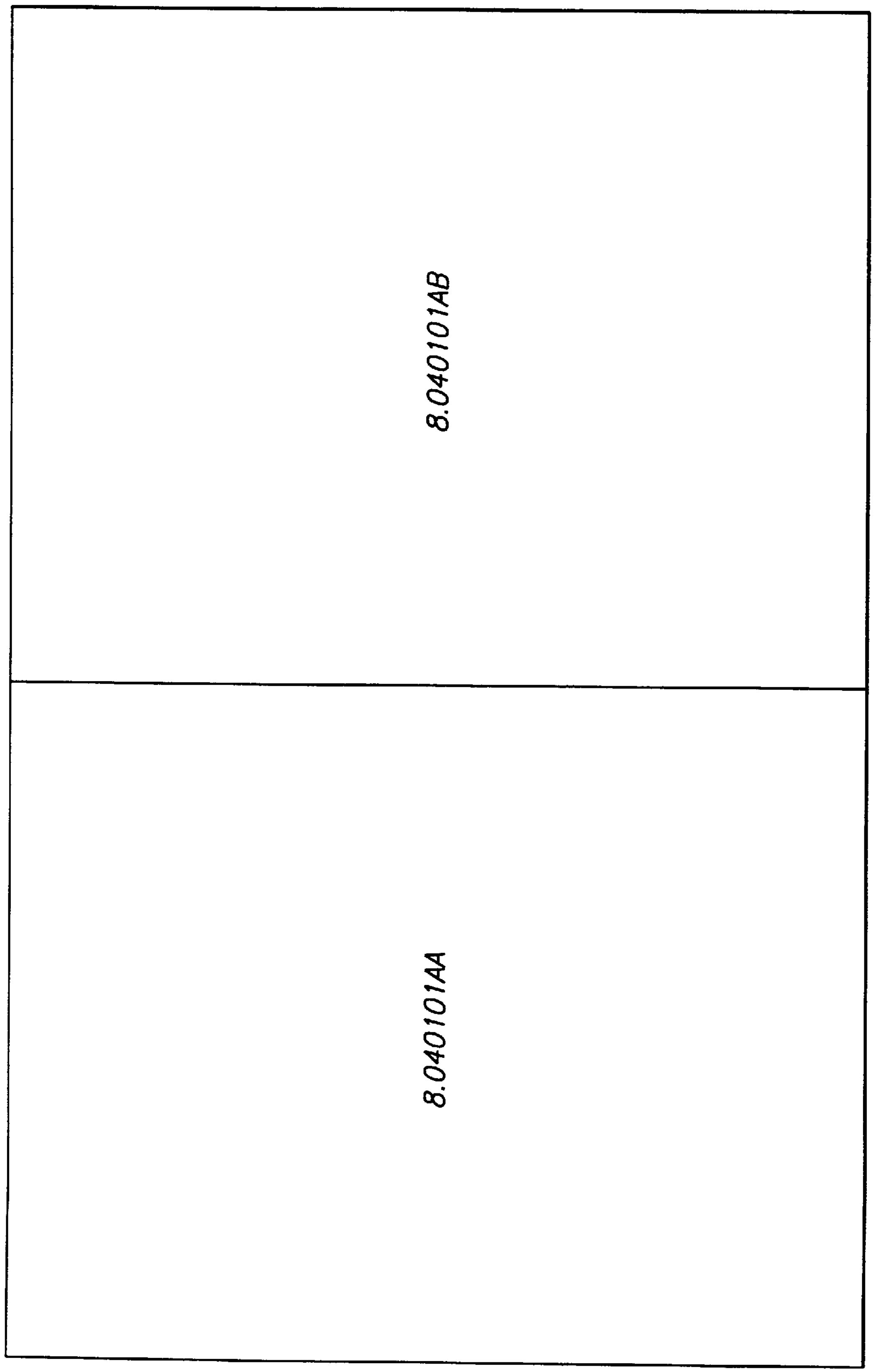
Fig. 8.040101

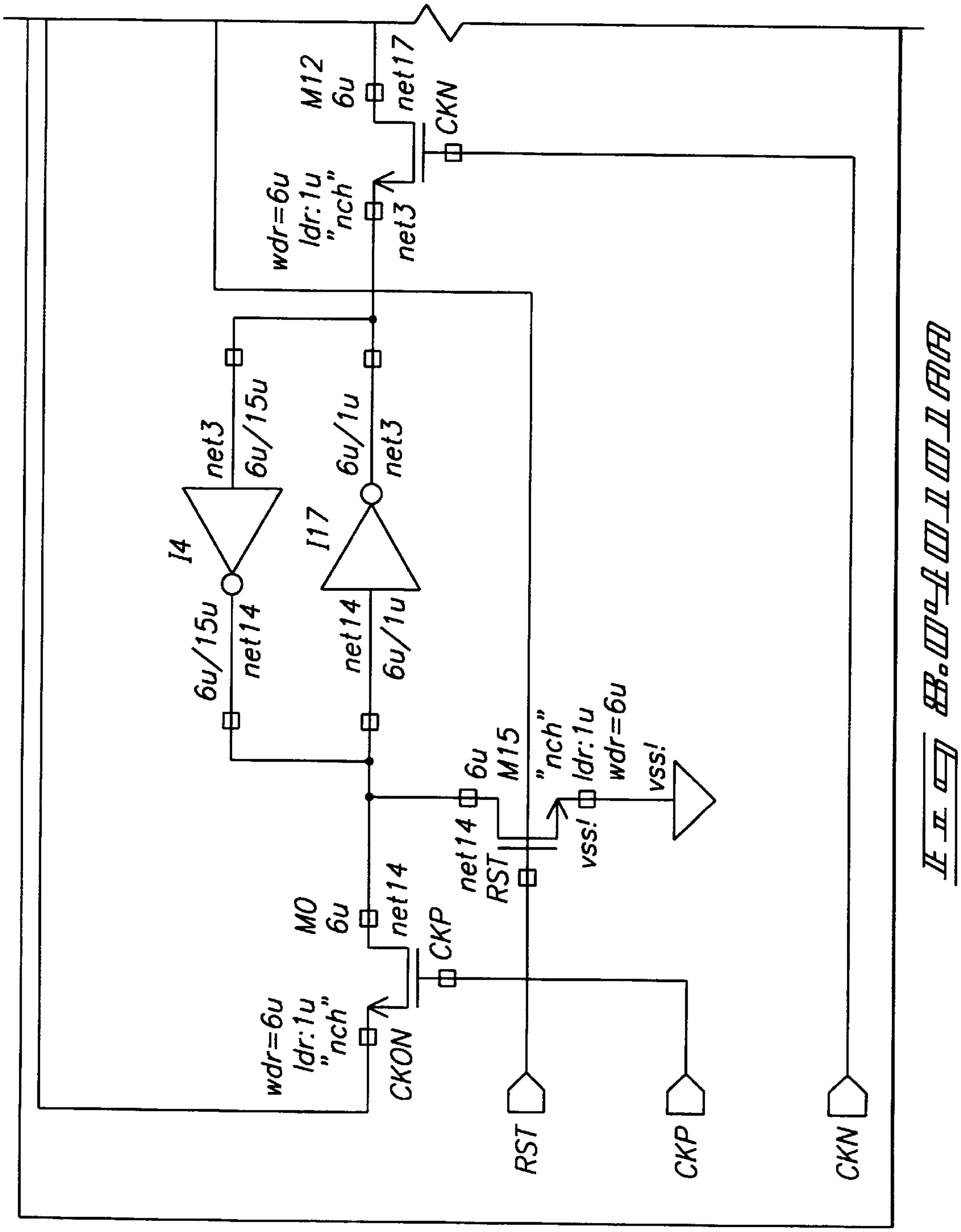
FIG. 8.040101AA

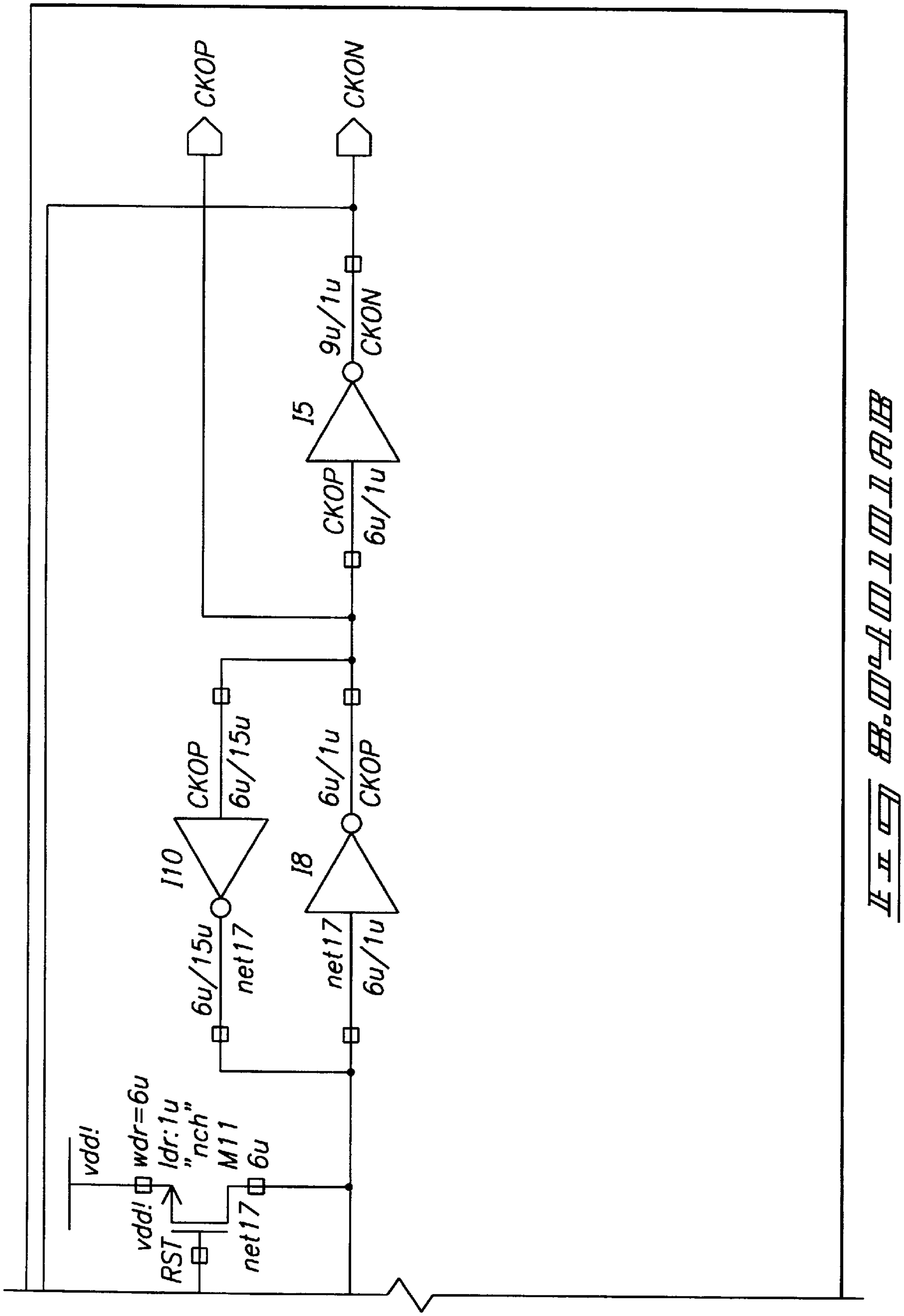
FIG. 8.04.010AB

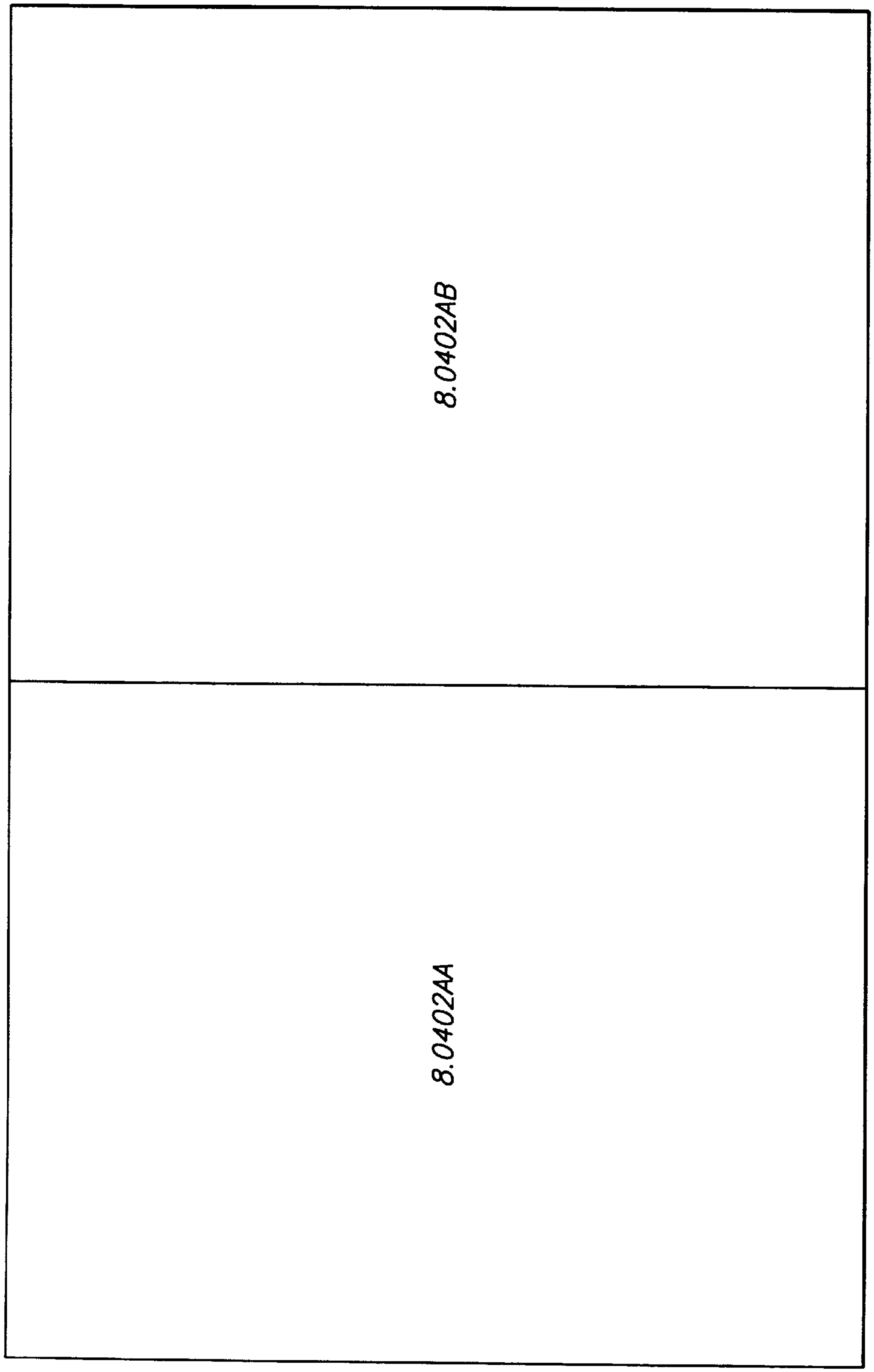
FIG. 8.0402

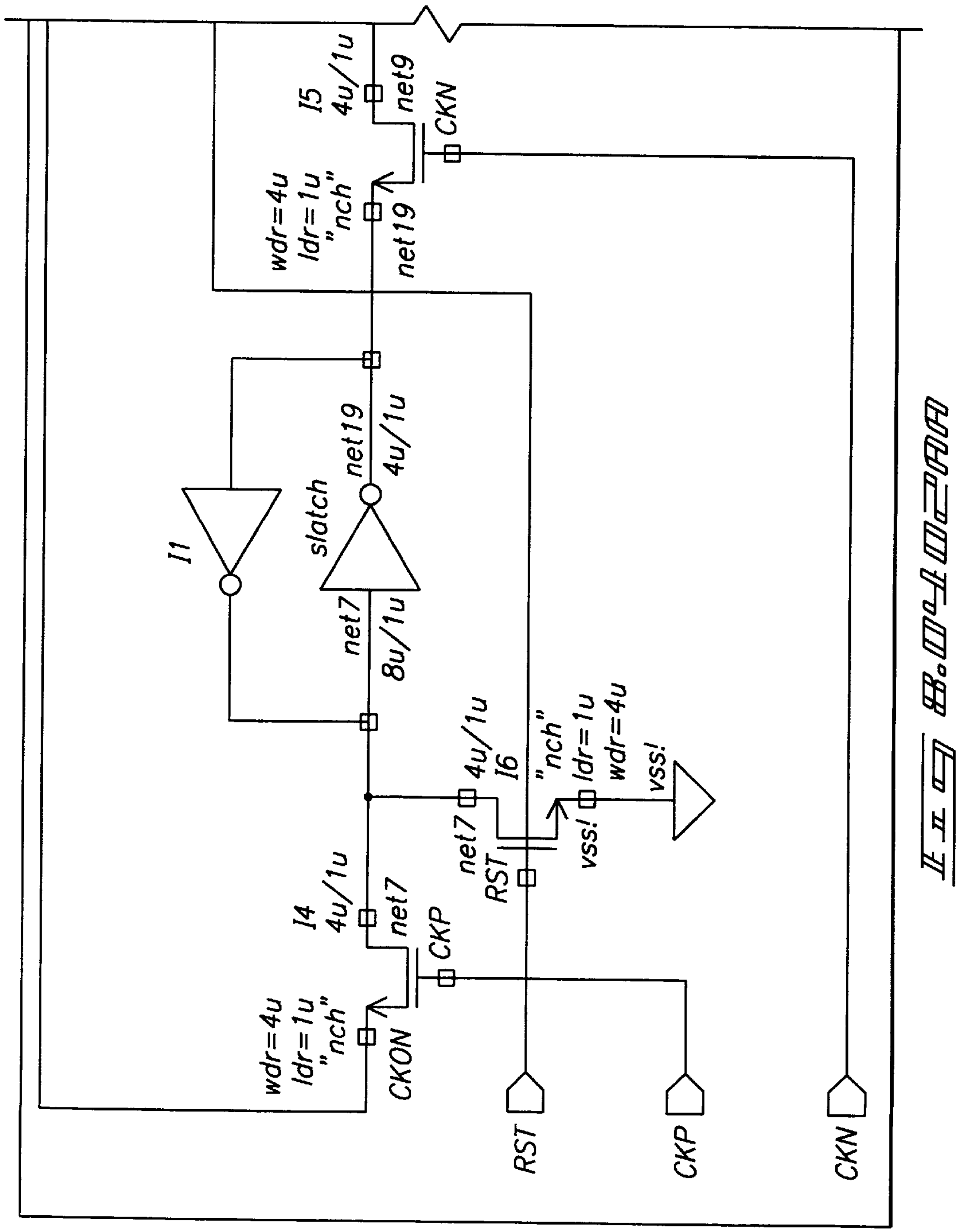
FIG. 8.040.2AA

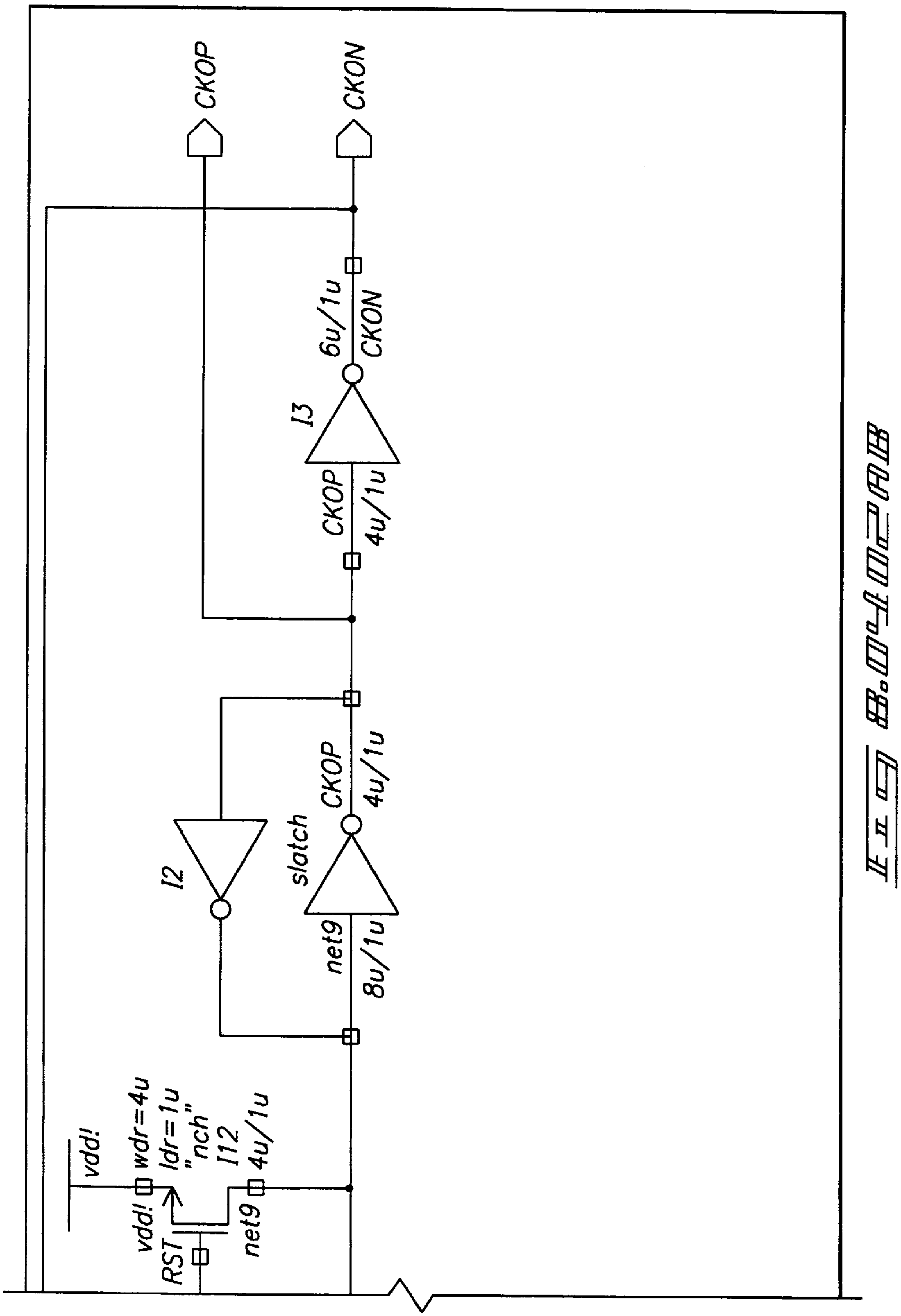
FIG. 8.042AB

| | | | | |
|---|---|---|---|---|
| 8.05AA | 8.05AB | 8.05AC | 8.05AD | 8.05AE |
| 8.05BA | 8.05BB | 8.05BC | 8.05BD | 8.05BE |
| 8.05CA | 8.05CB | 8.05CC | 8.05CD | 8.05CE |
| 8.05DA | 8.05DB | 8.05DC | 8.05DD | 8.05DE |

Fig 8.05

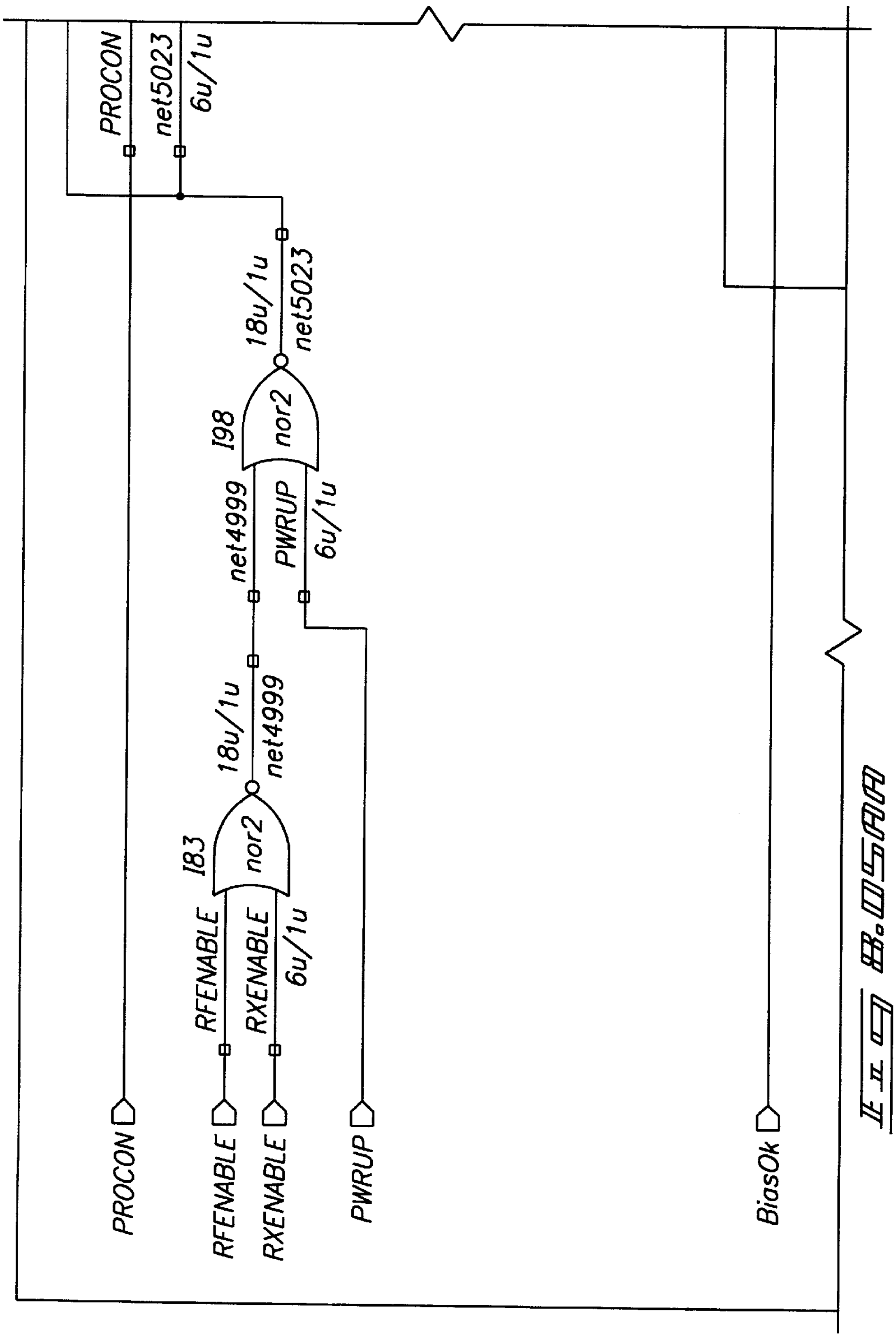
FIG. 8.05AA

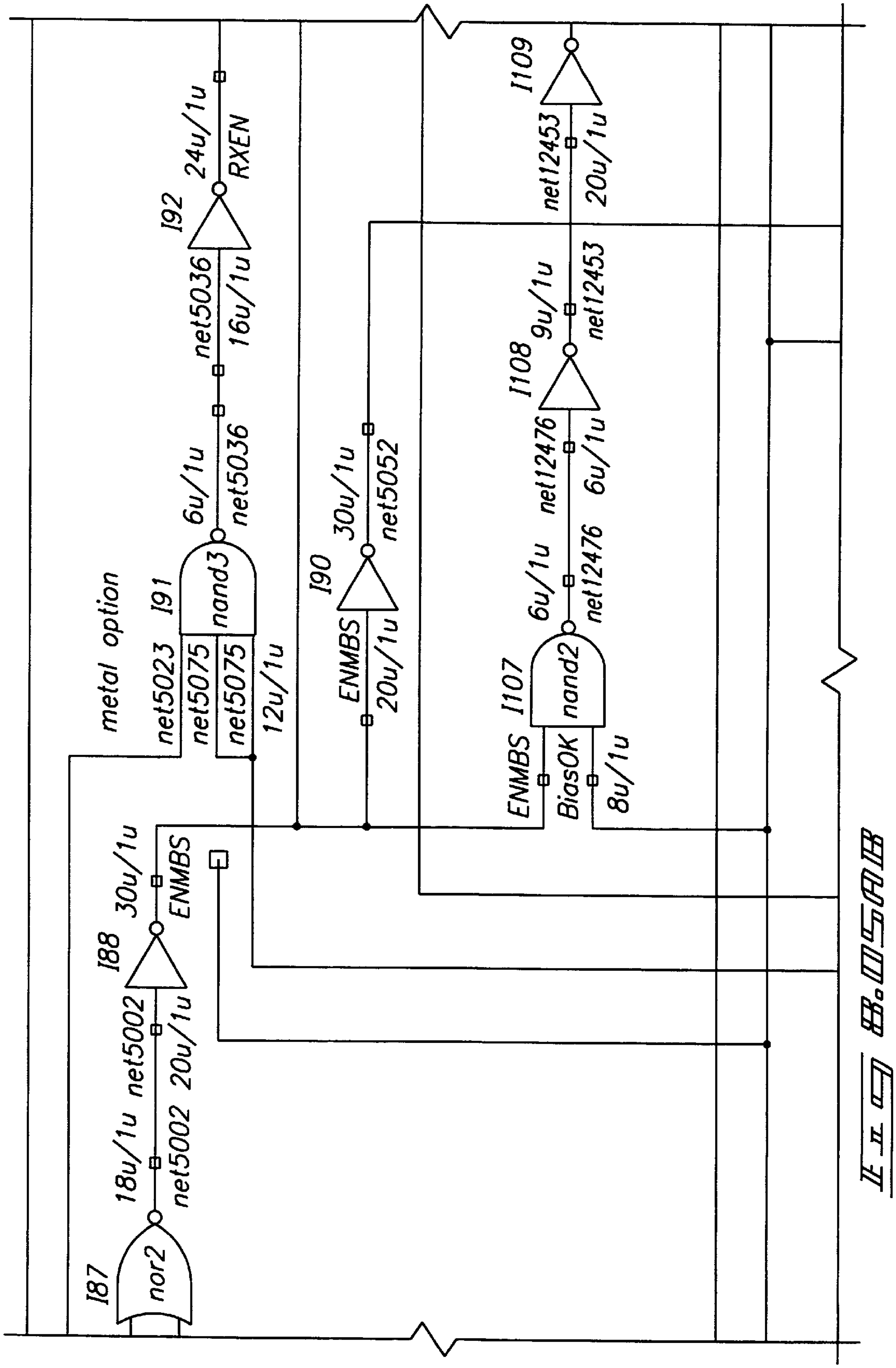
FIG. 8.05AB

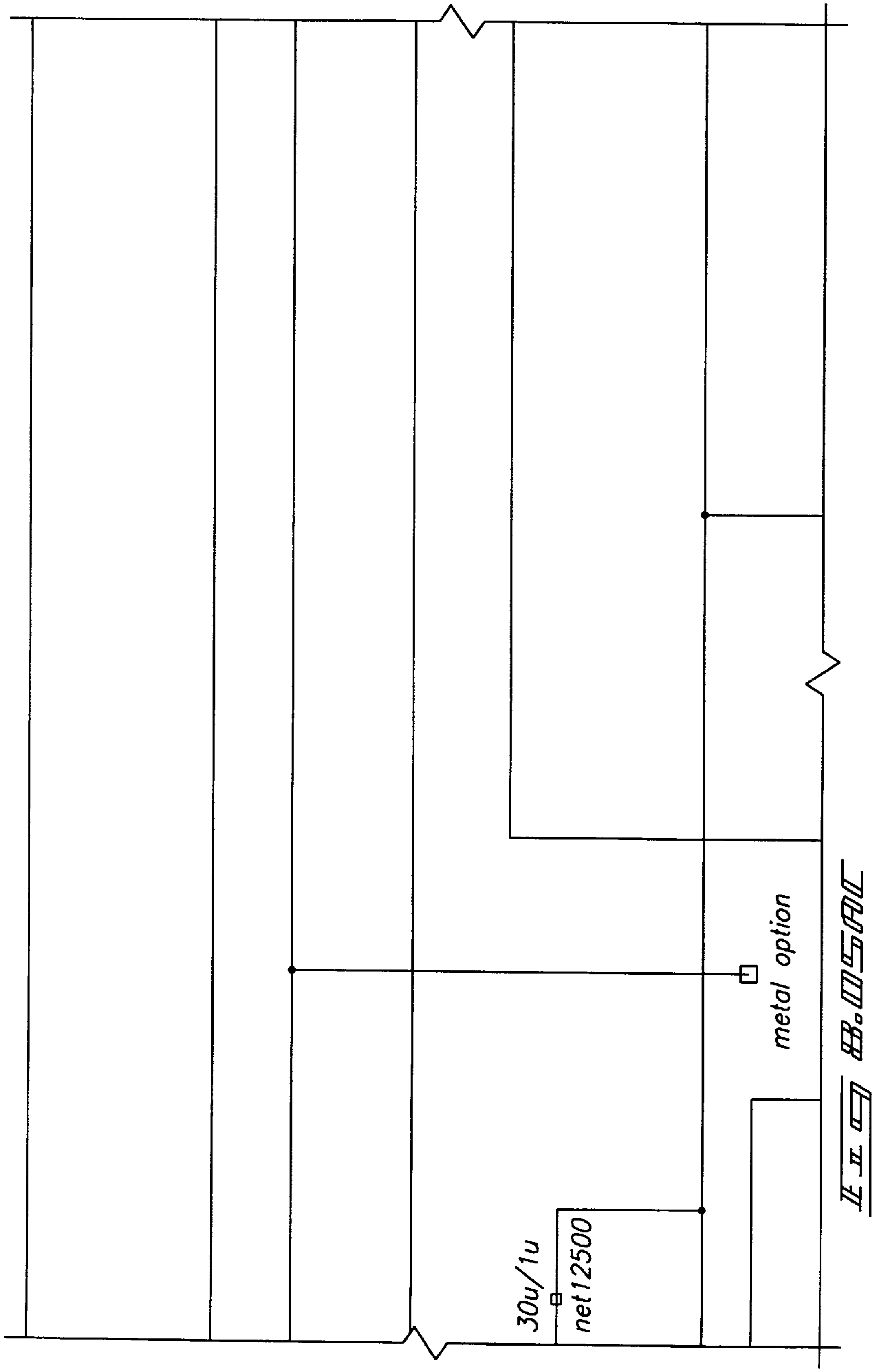
FIG. 8.005AC

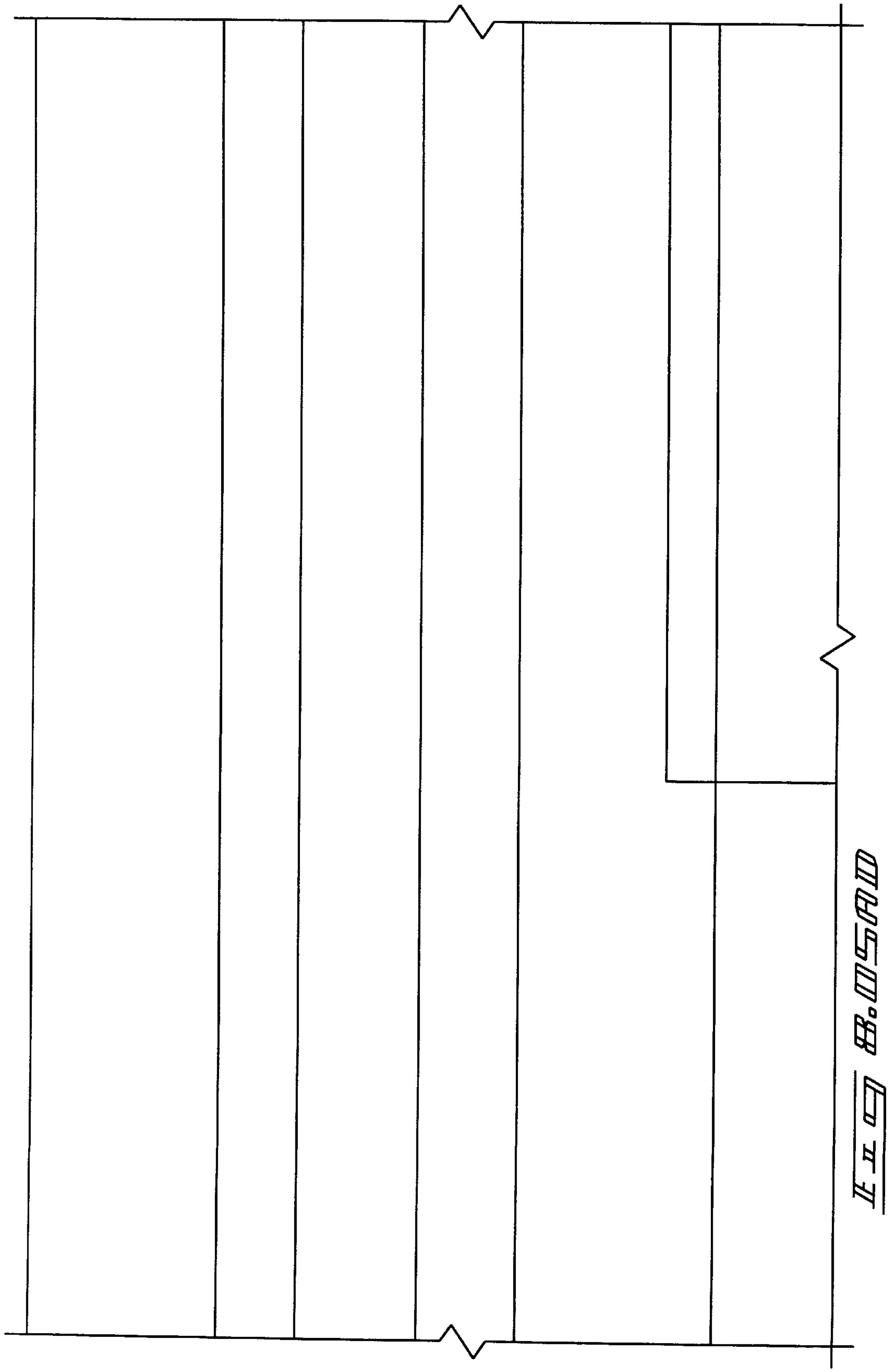
FIG. 8.05AD

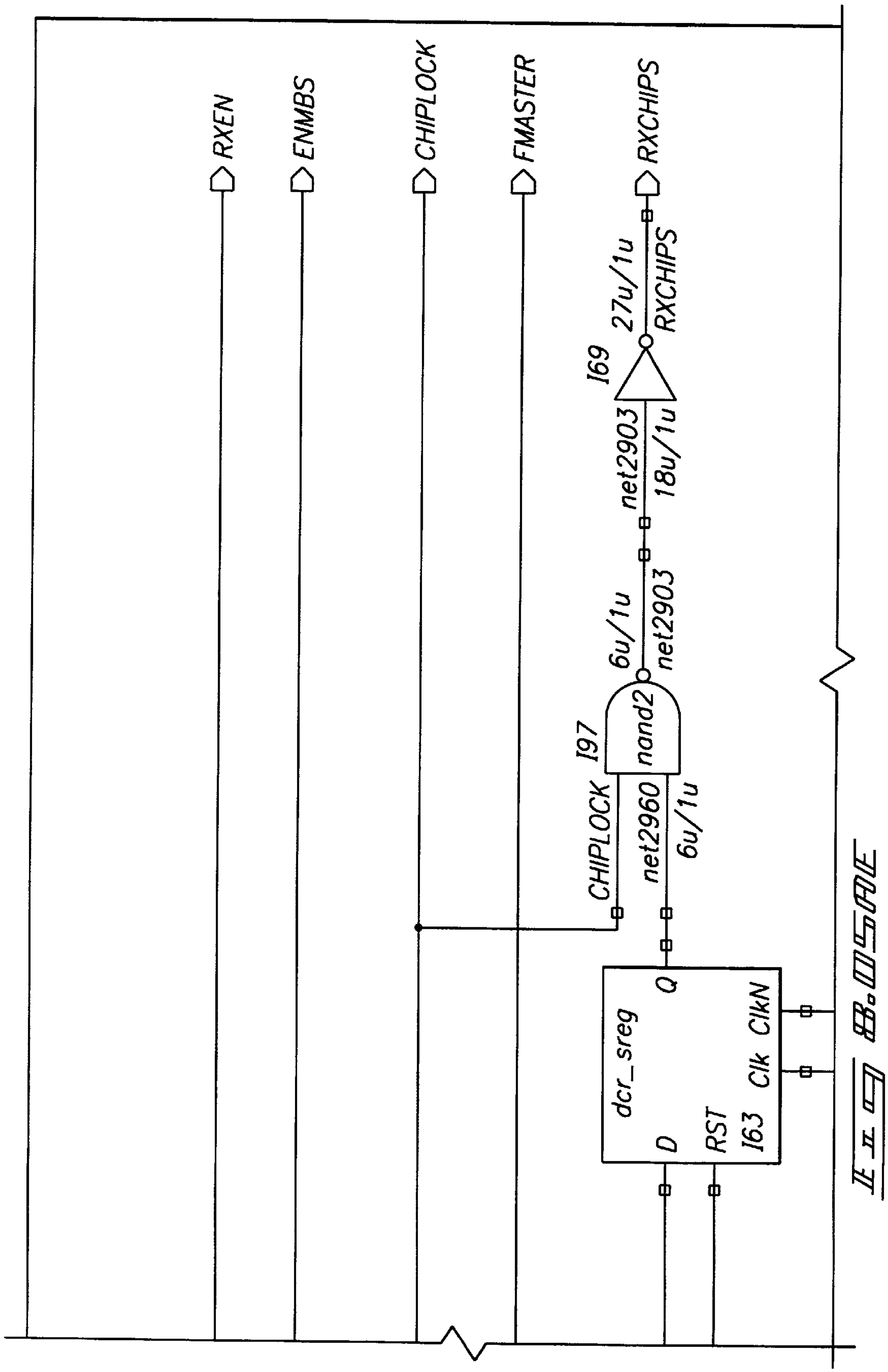
Fig. 8.05AE

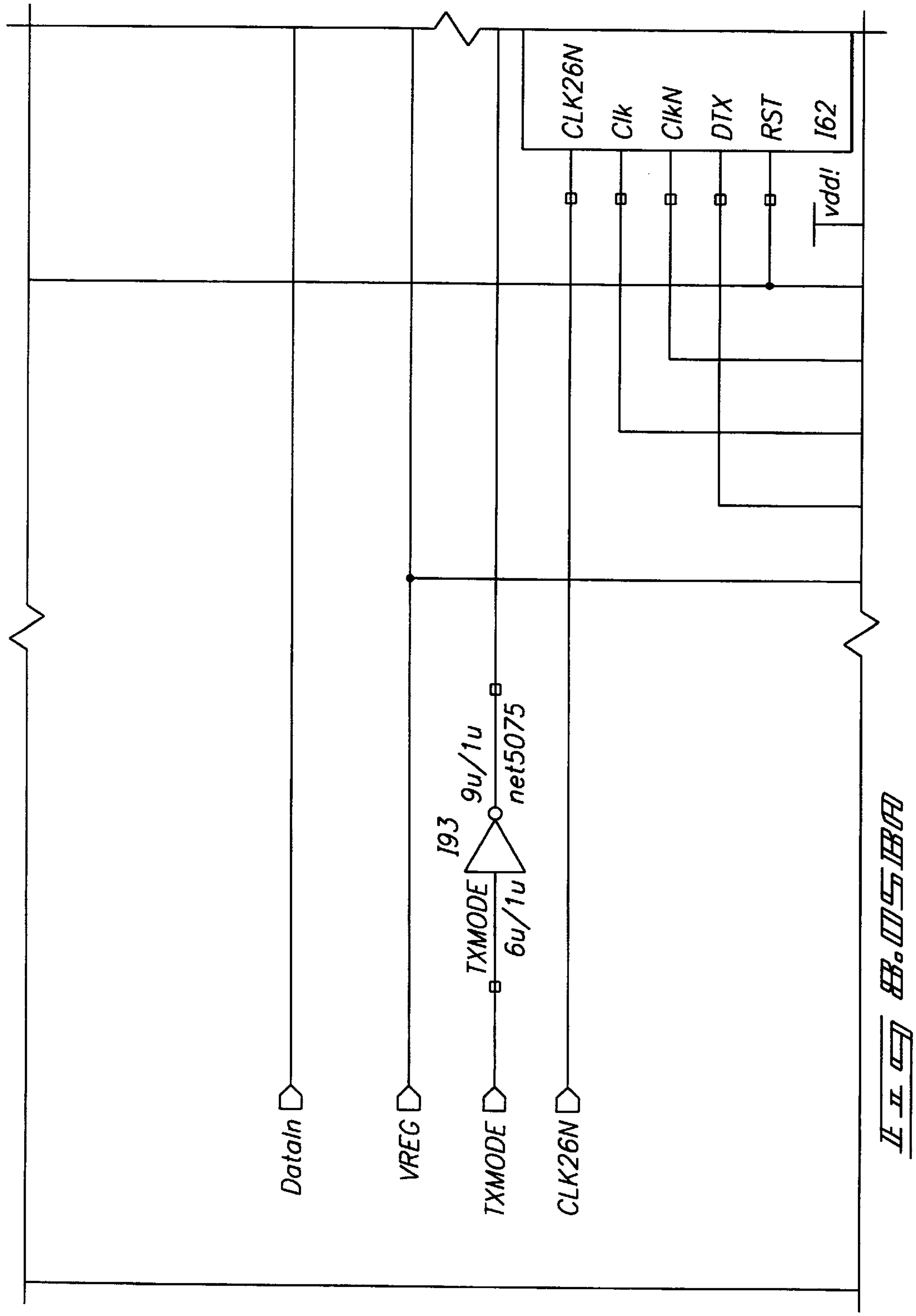
Fig. 8.05BA

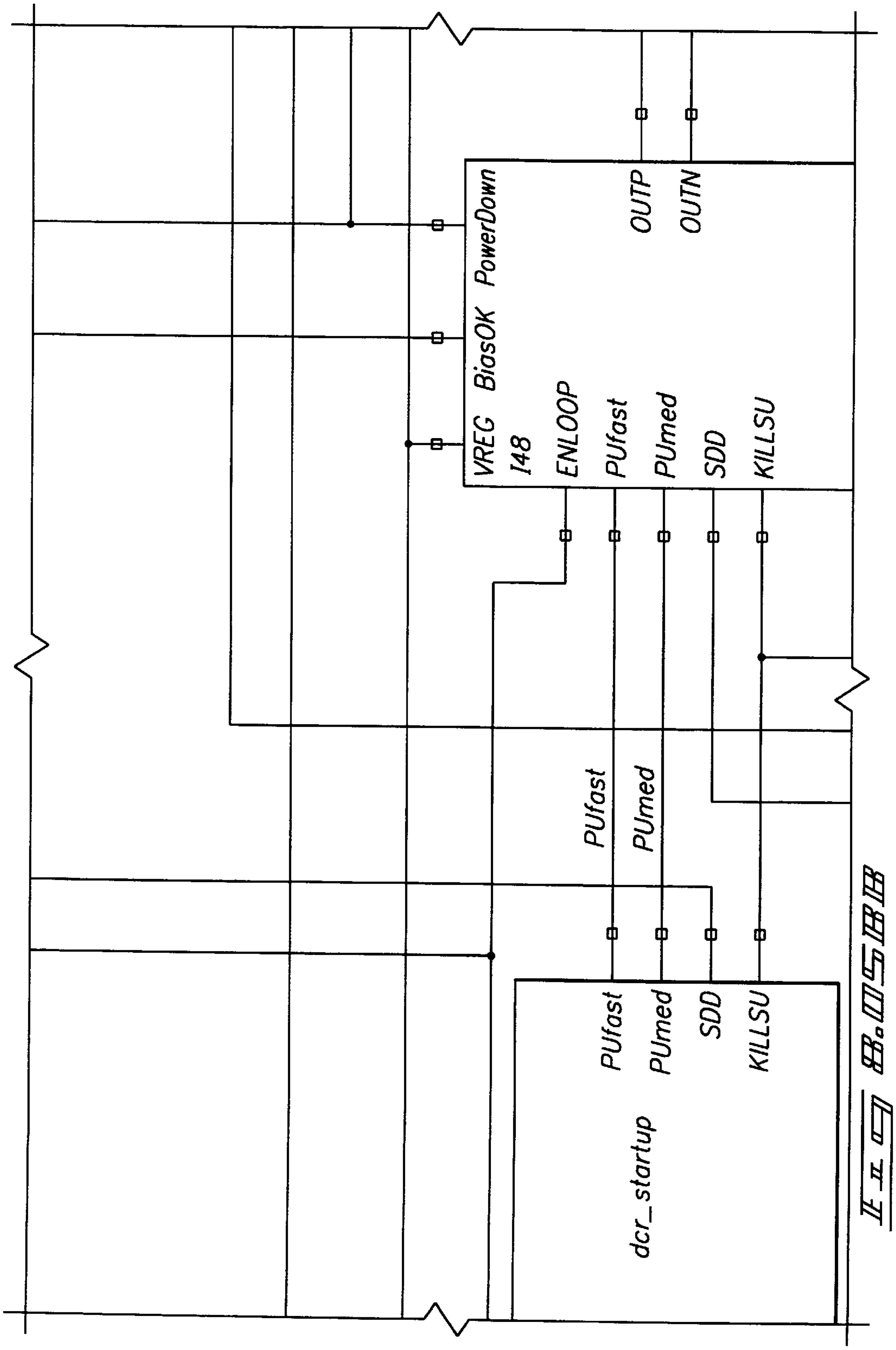
FIG. 8.05BB

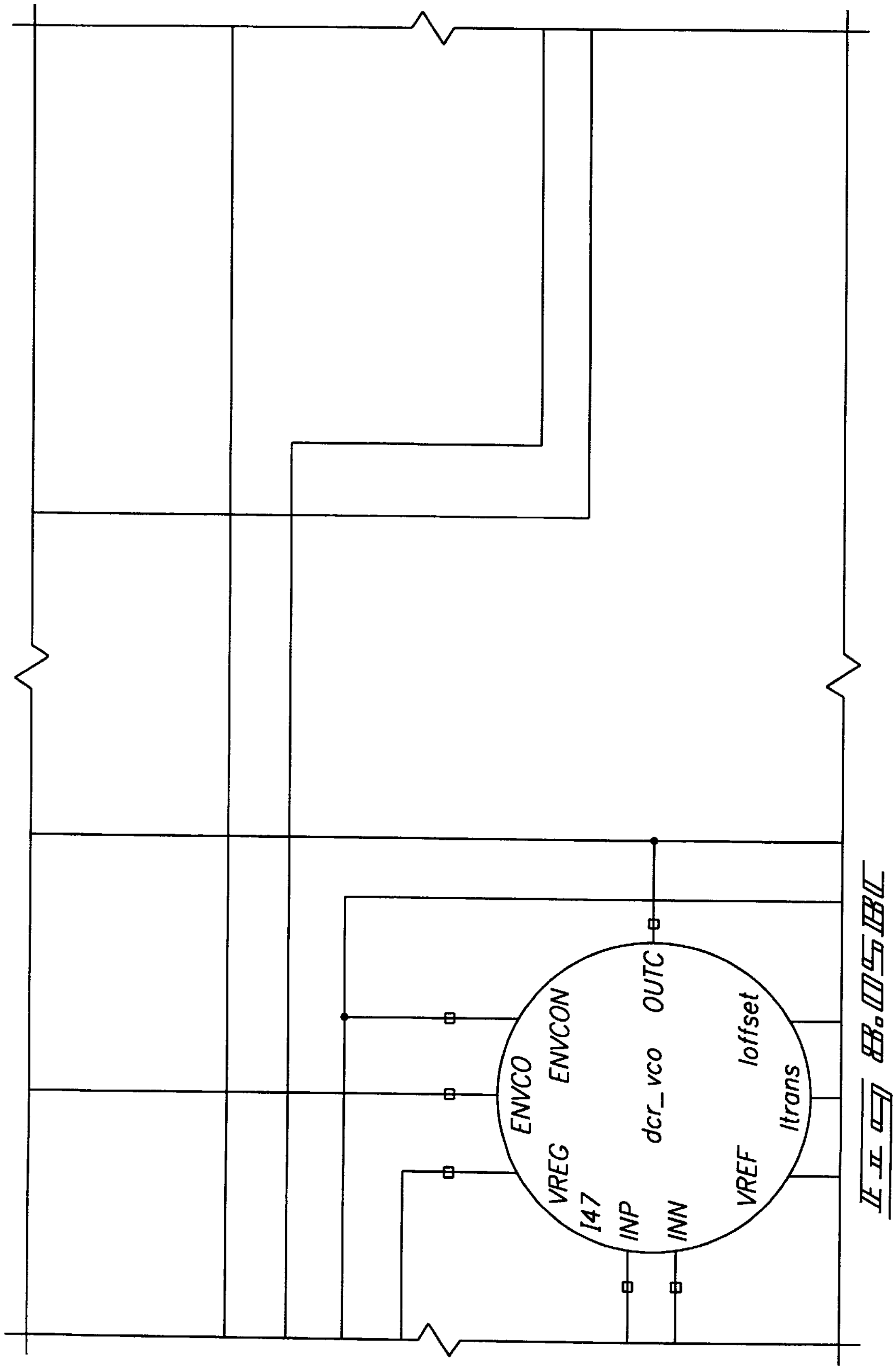
Fig. 8.05BC

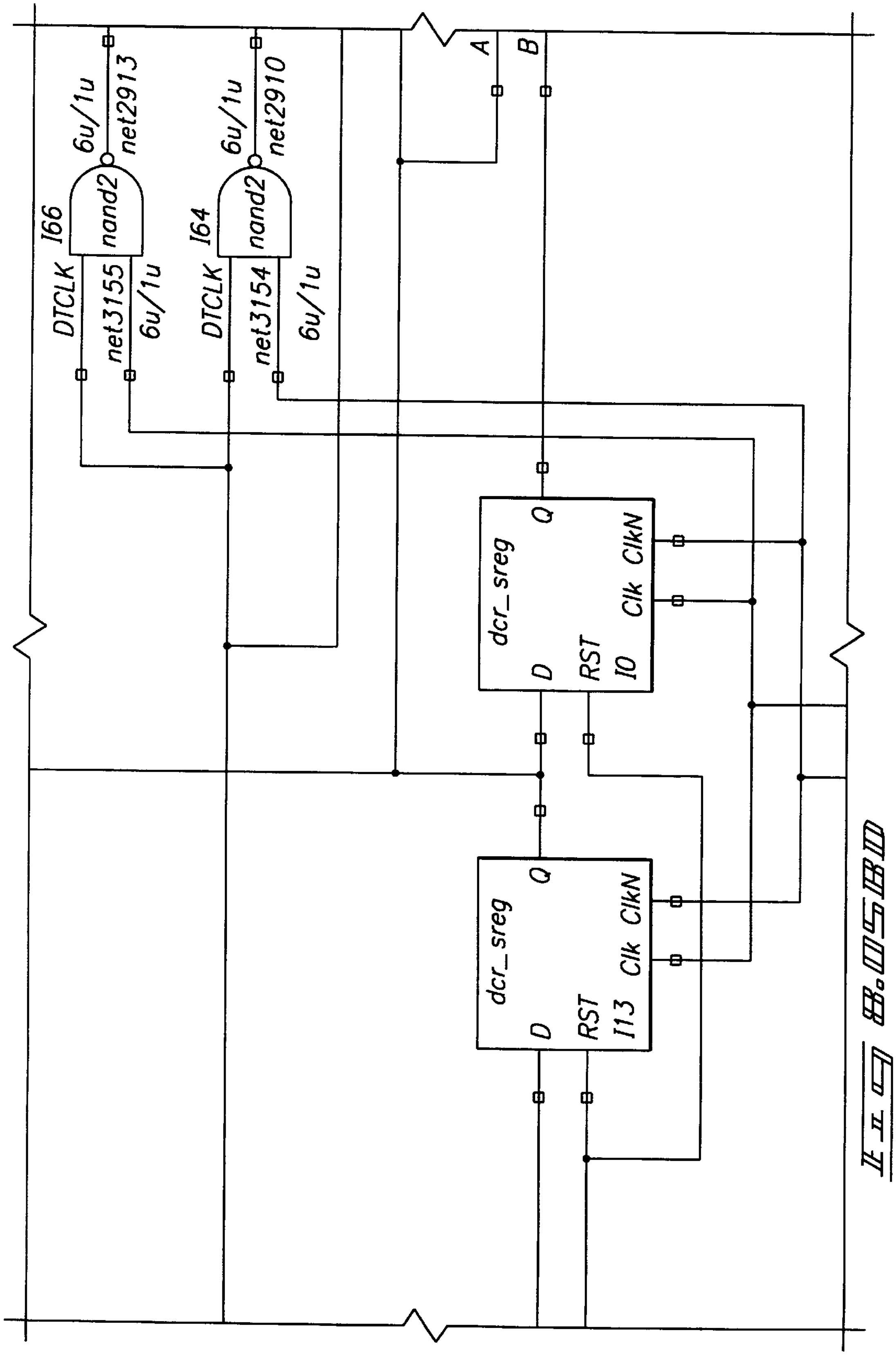
FIG. 8.05BD

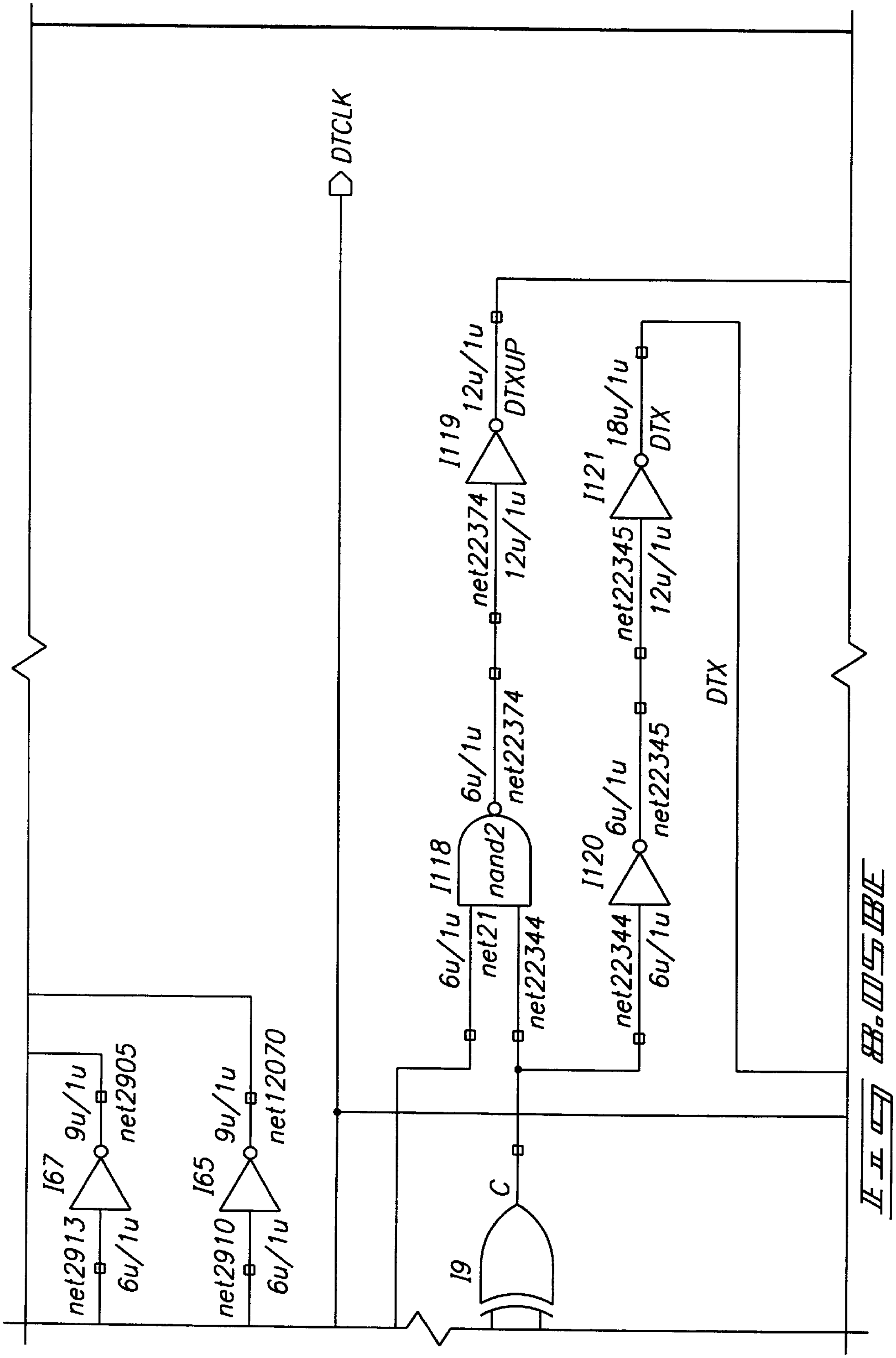
Fig. 8.05BE

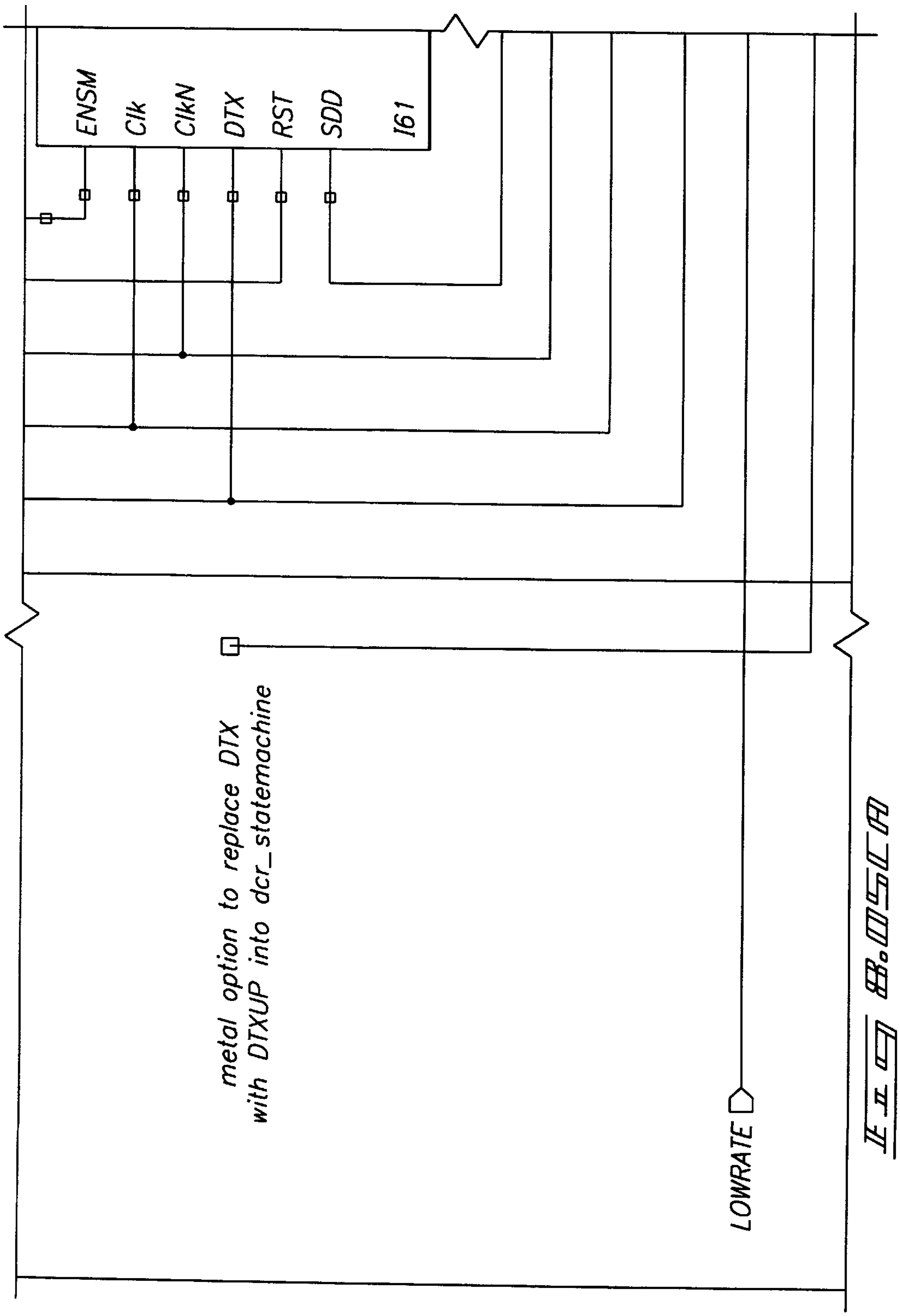
Fig. 8.05CA

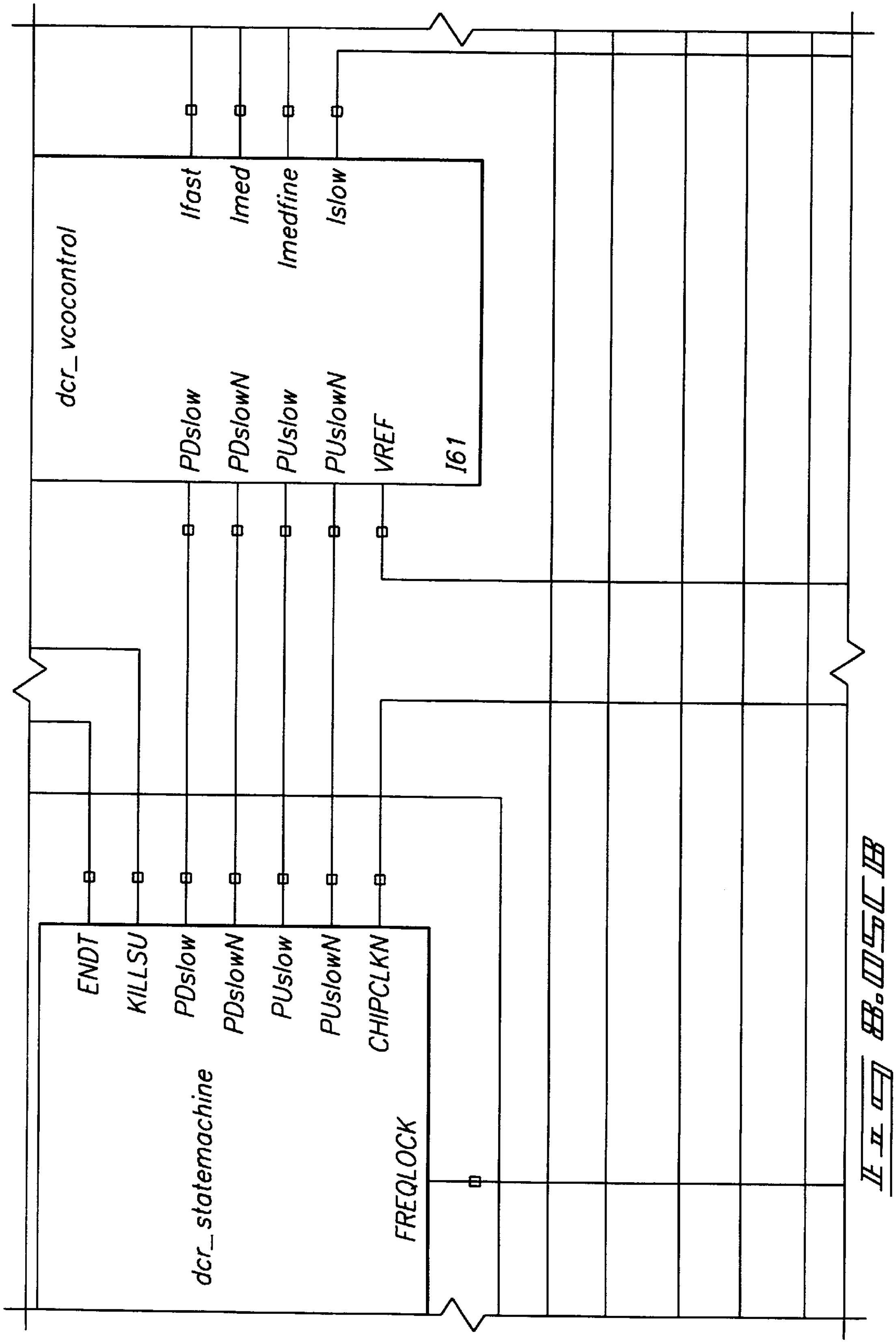
FIG. 8.05CB

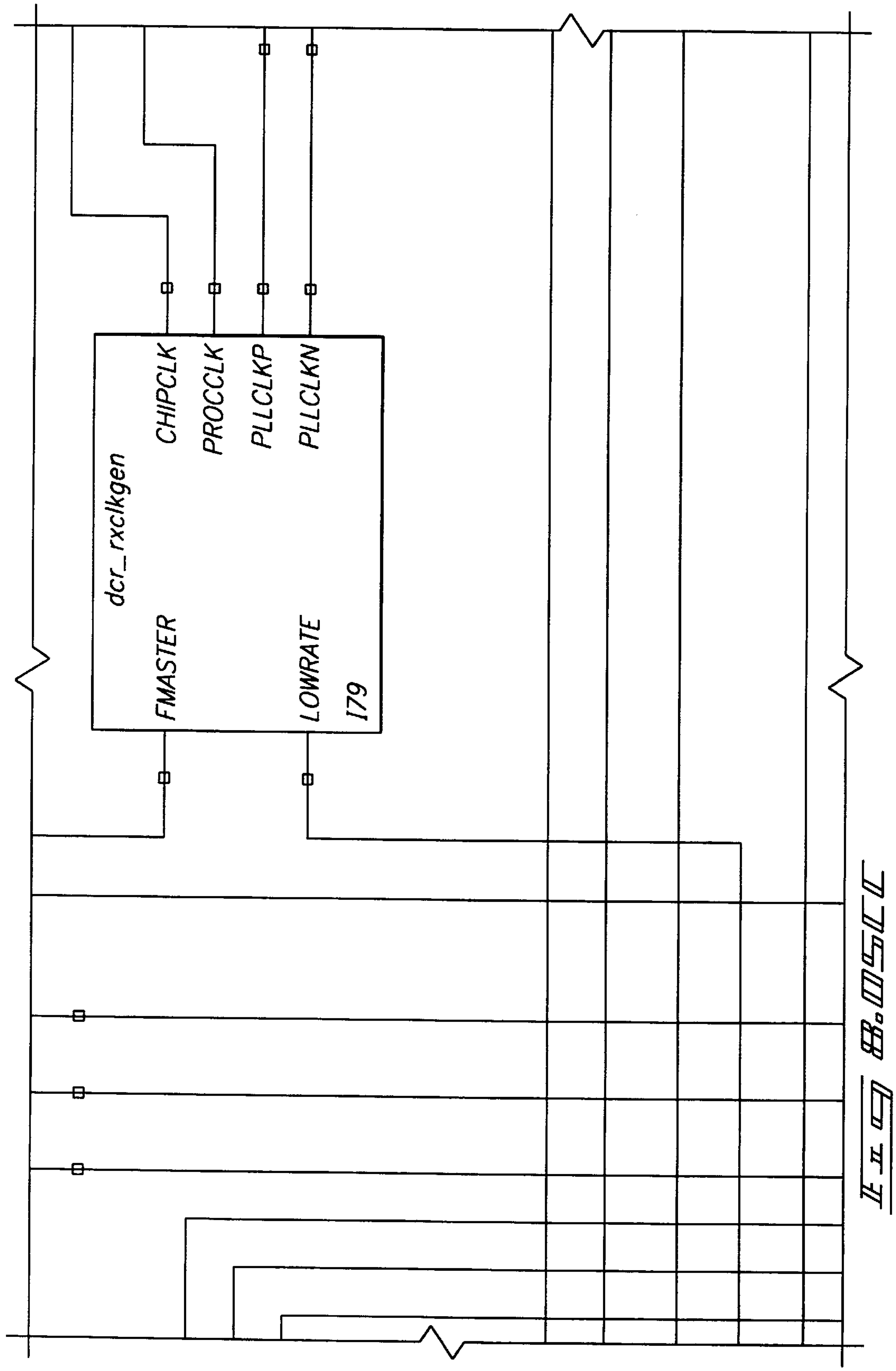
FIG. 8.05CC

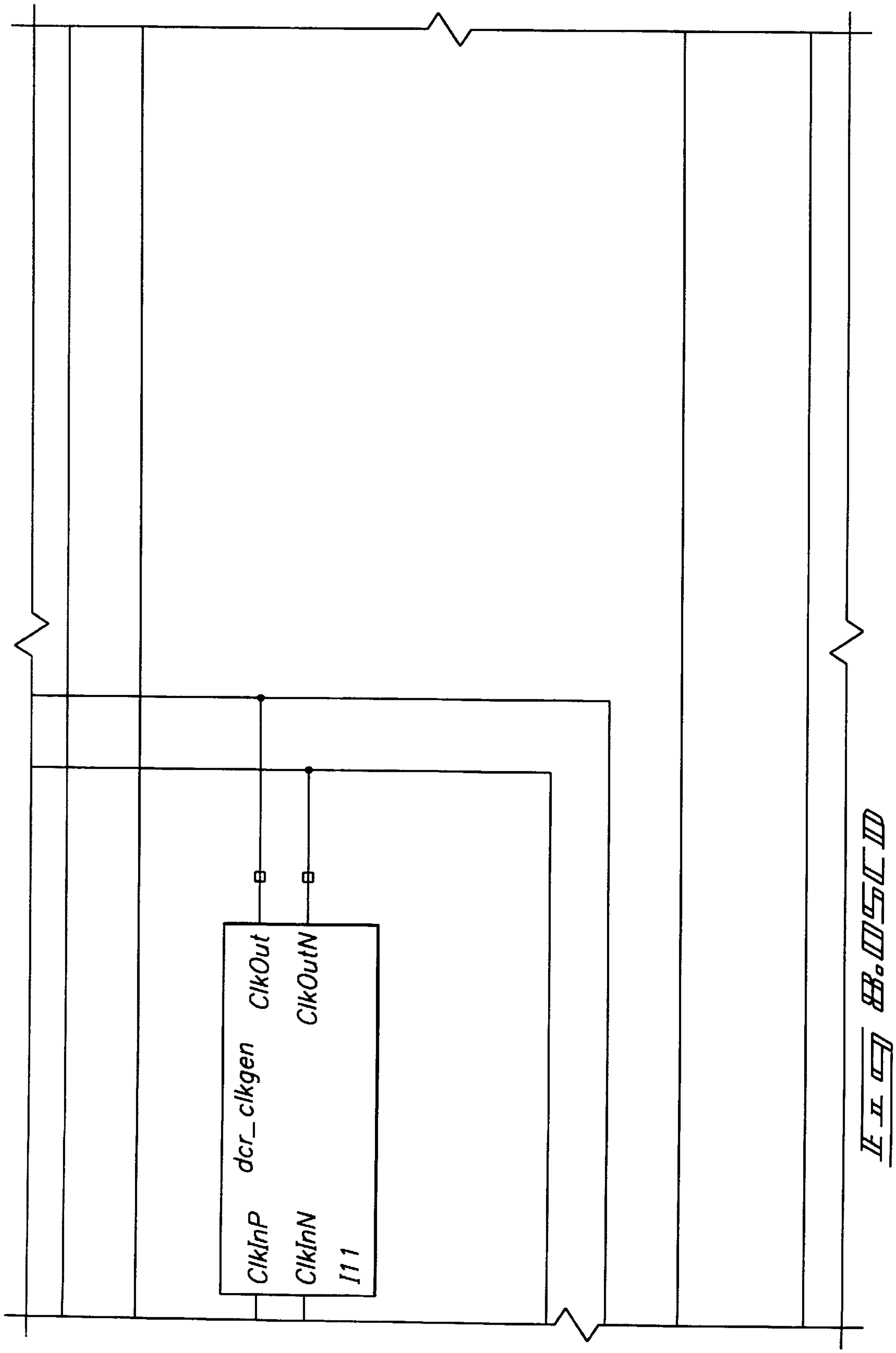
Fig. 8.05CD

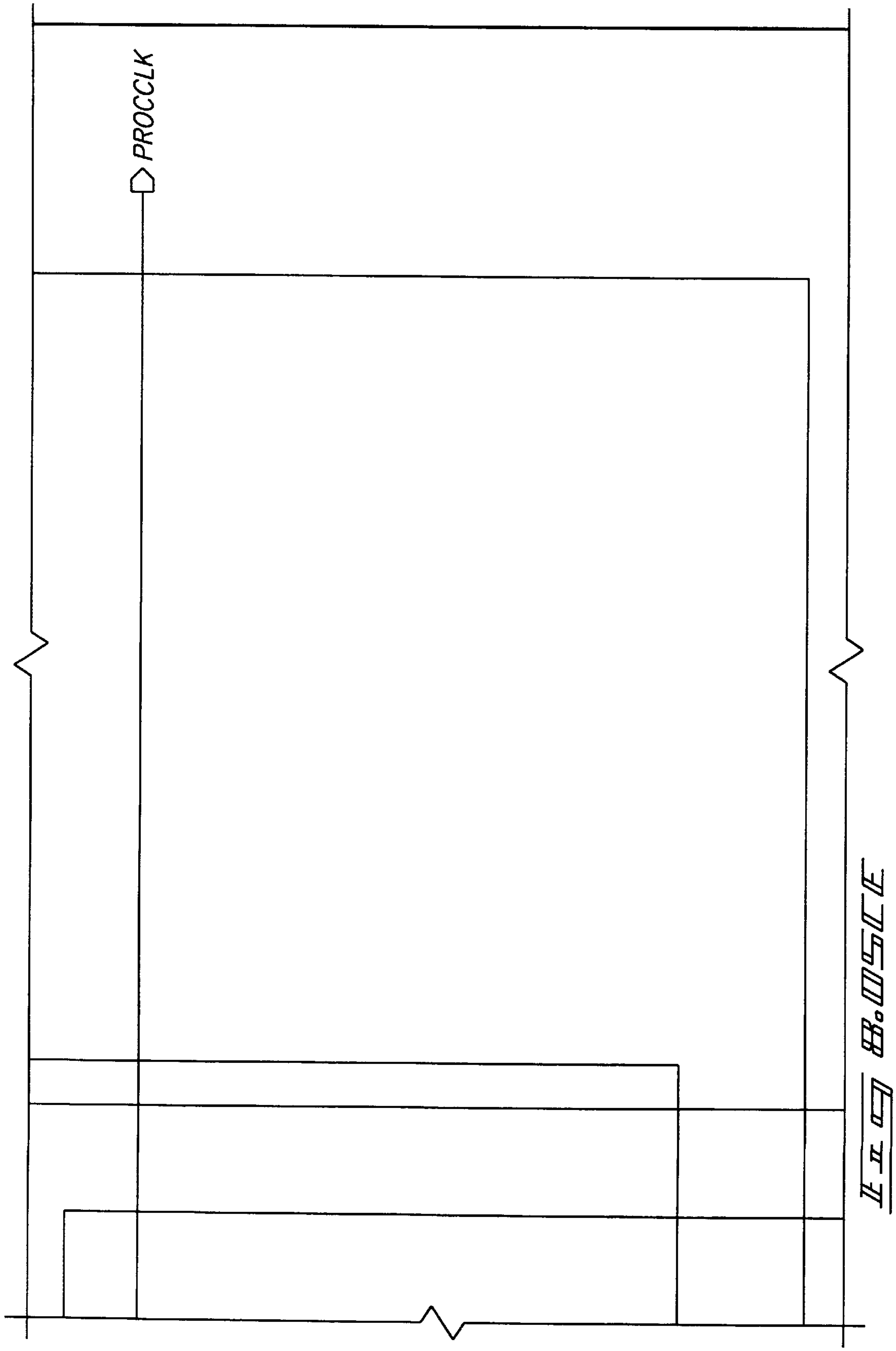
FIG. 8.05CE

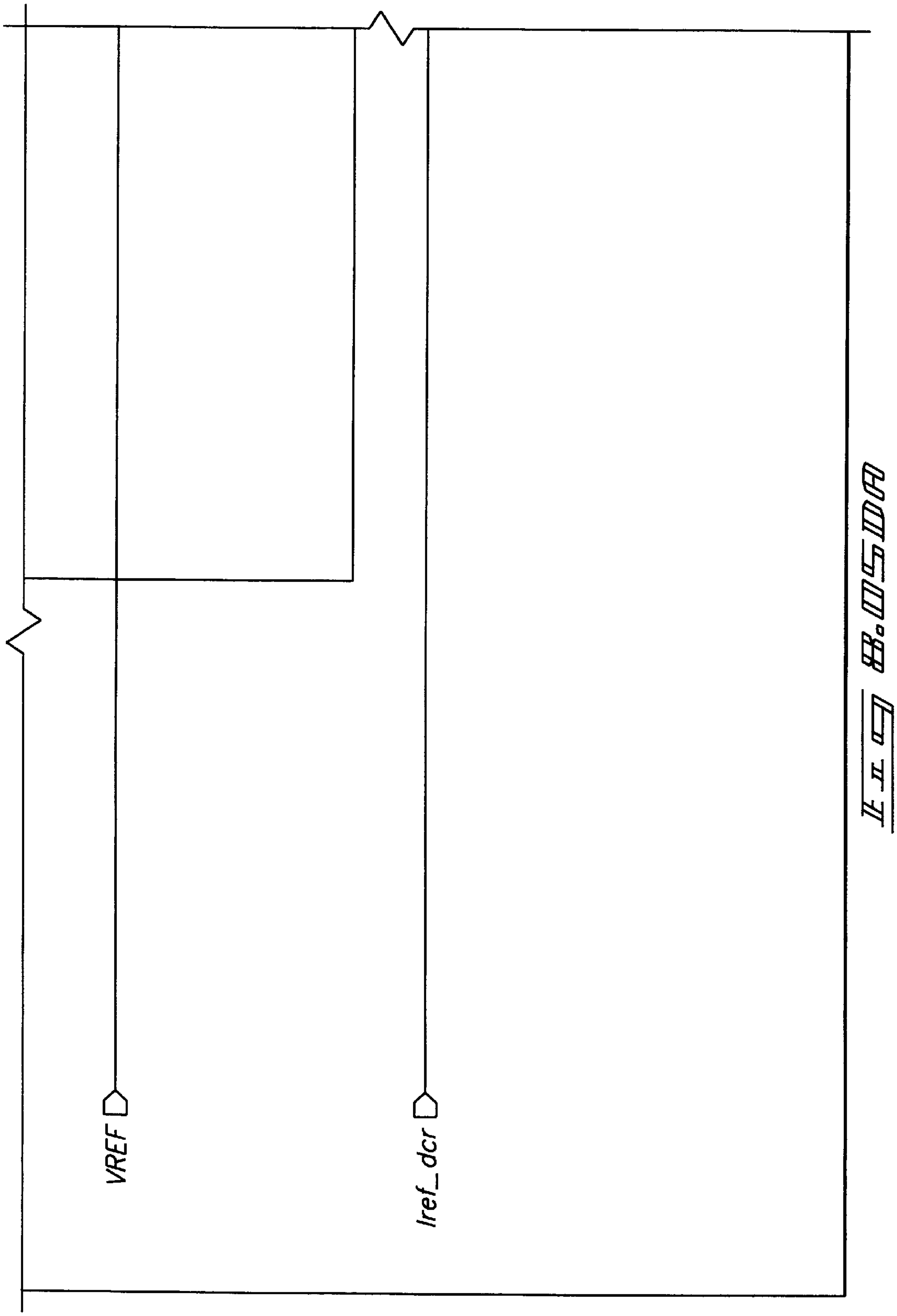
FIG. 8.05DA

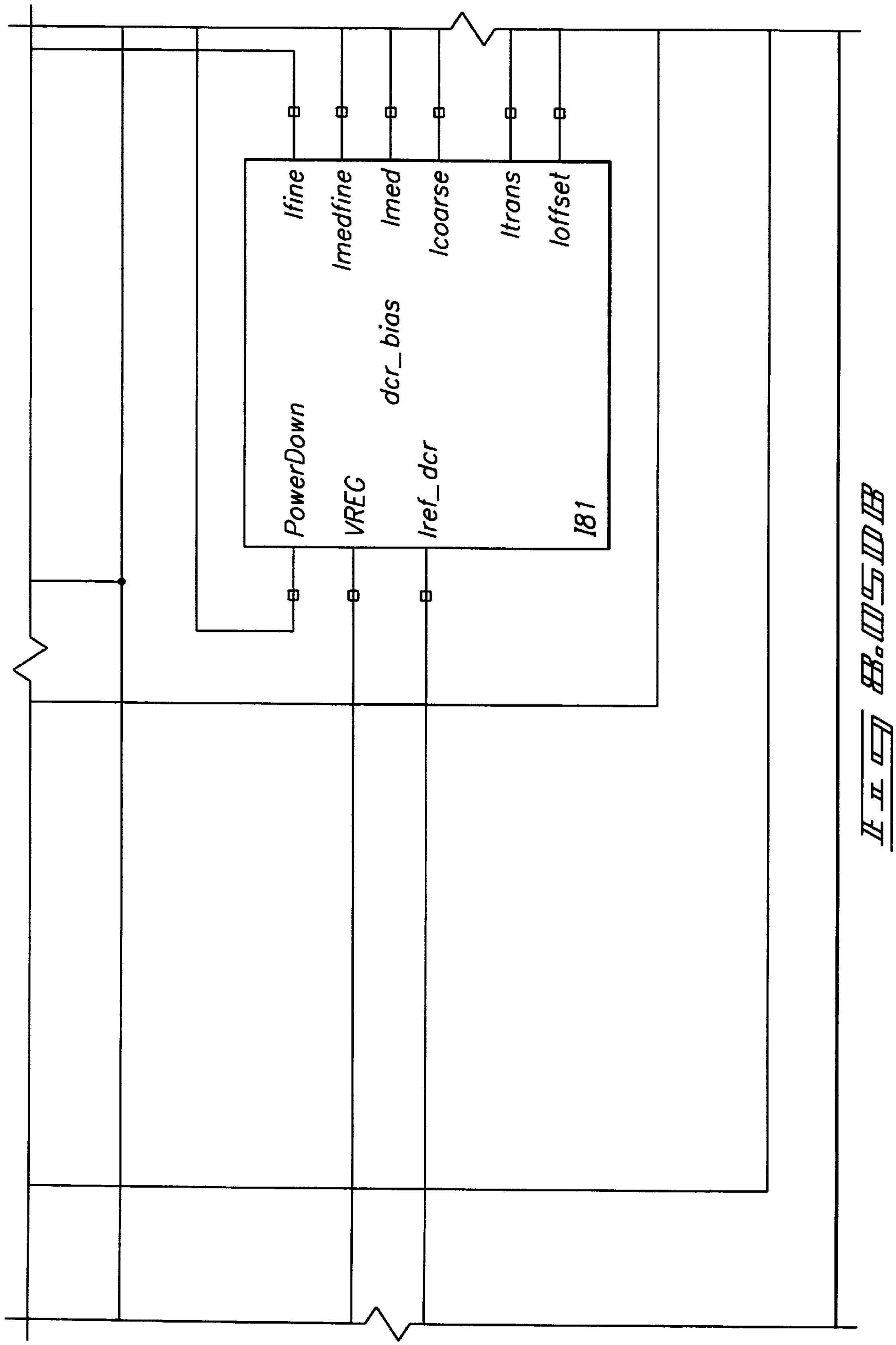
FIG 8.05DB

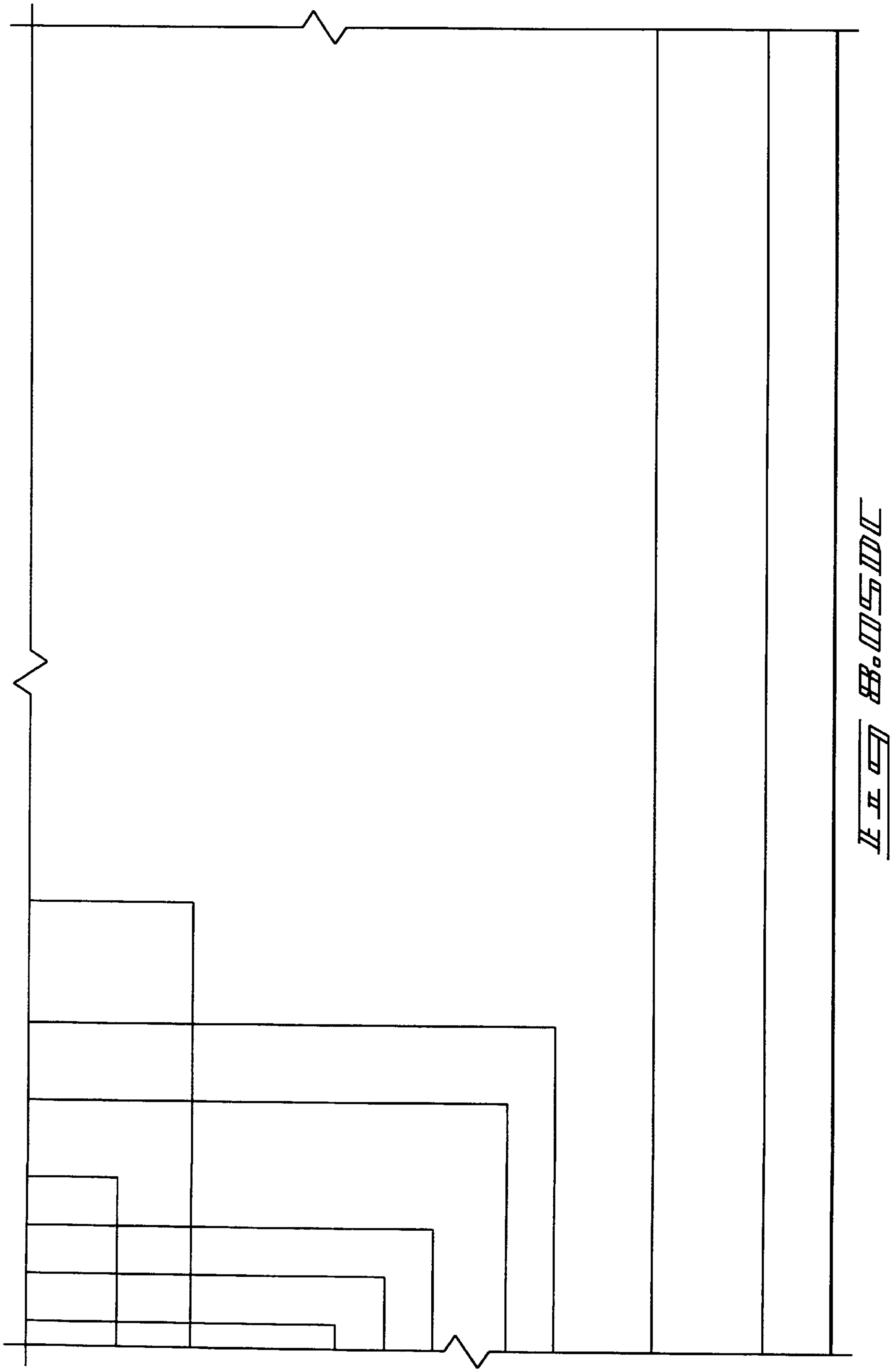
FIG. 8.05DC

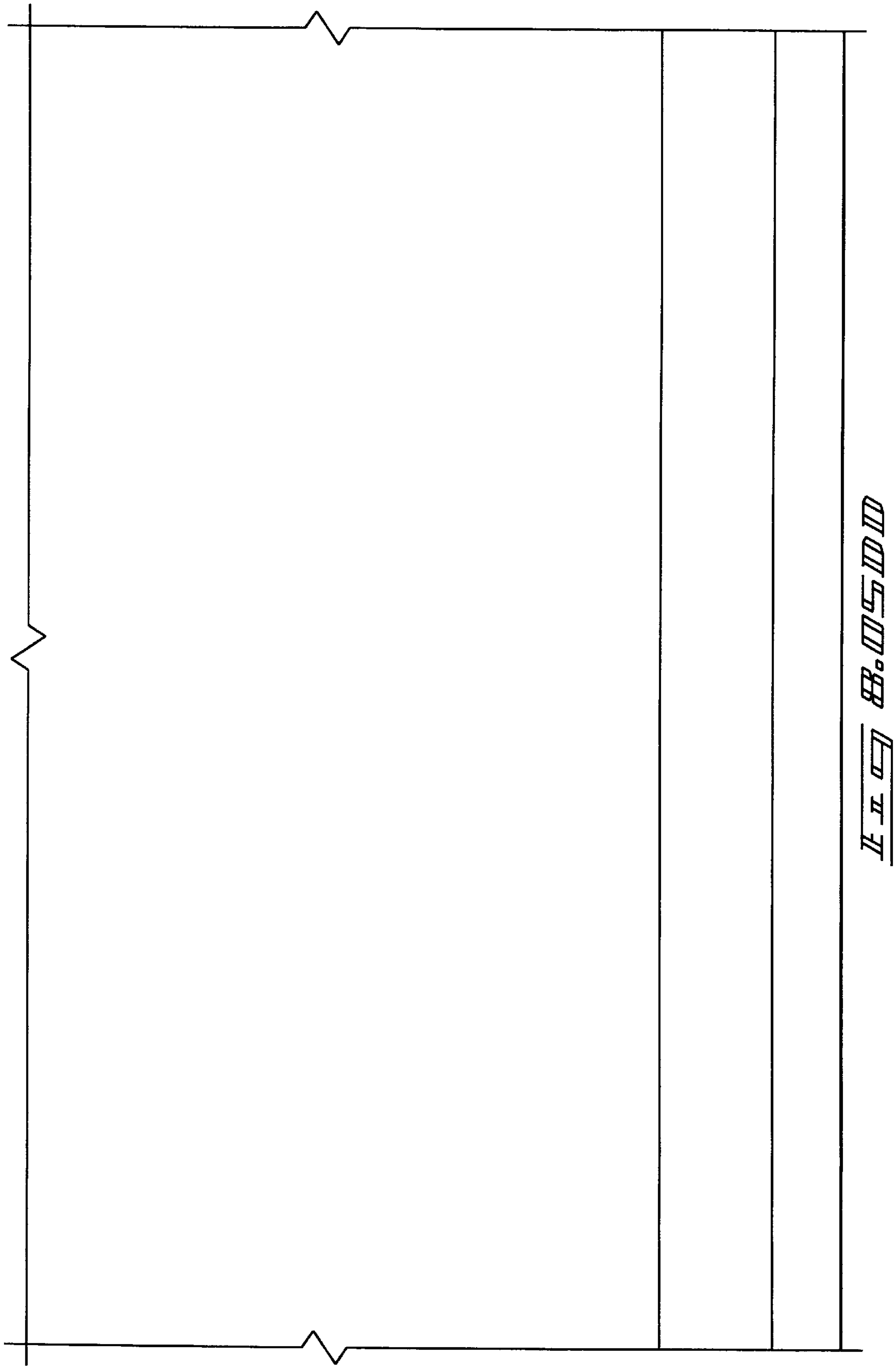
FIG. 8.05DD

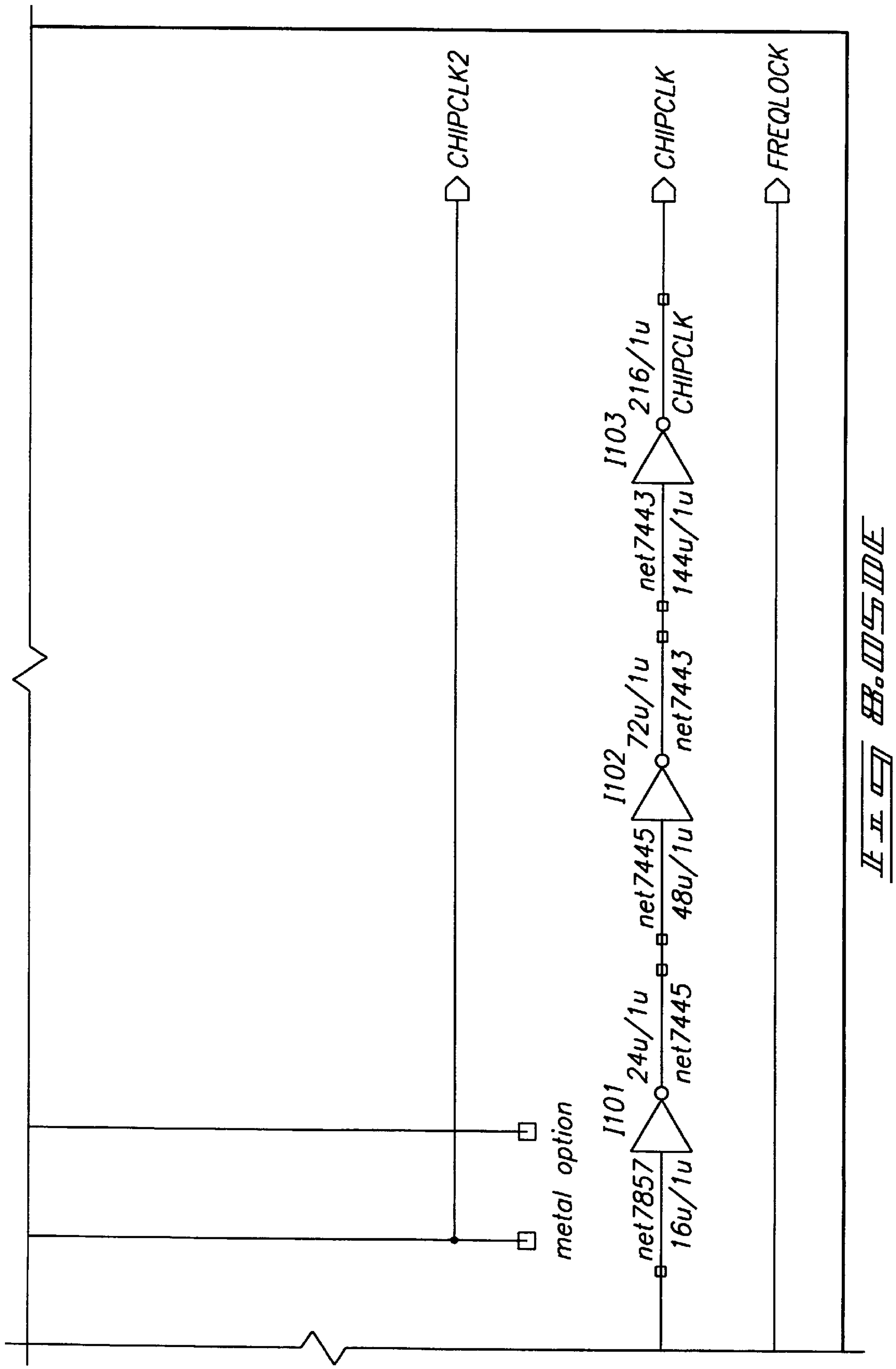
Fig. 8.05DE

| | | | | |
|---|---|---|---|---|
| 8.0501AA | 8.0501AB | 8.0501AC | 8.0501AD | 8.0501AE |
| 8.0501BA | 8.0501BB | 8.0501BC | 8.0501BD | 8.0501BE |

Fig 8.0501

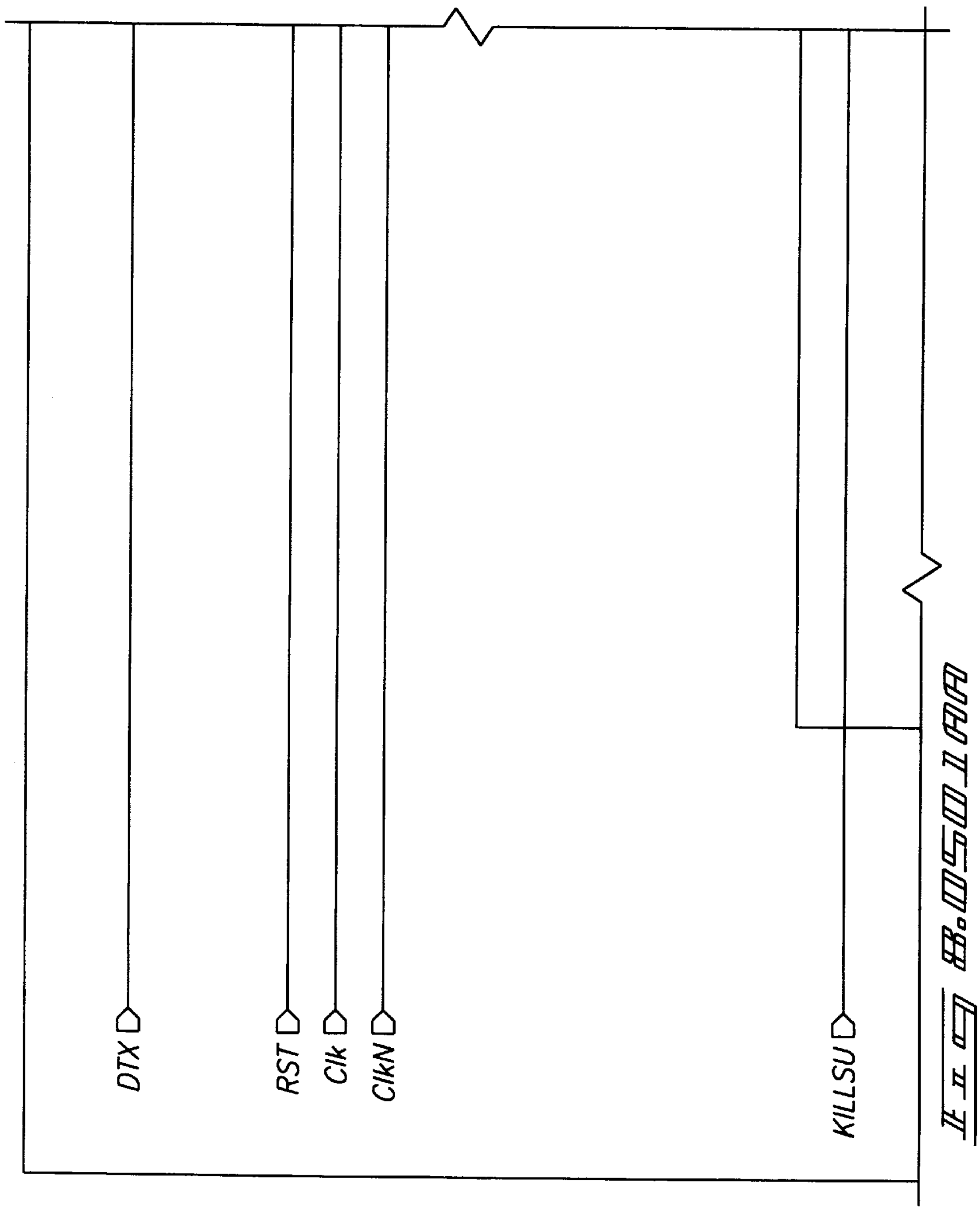
FIG. 8.050.11AA

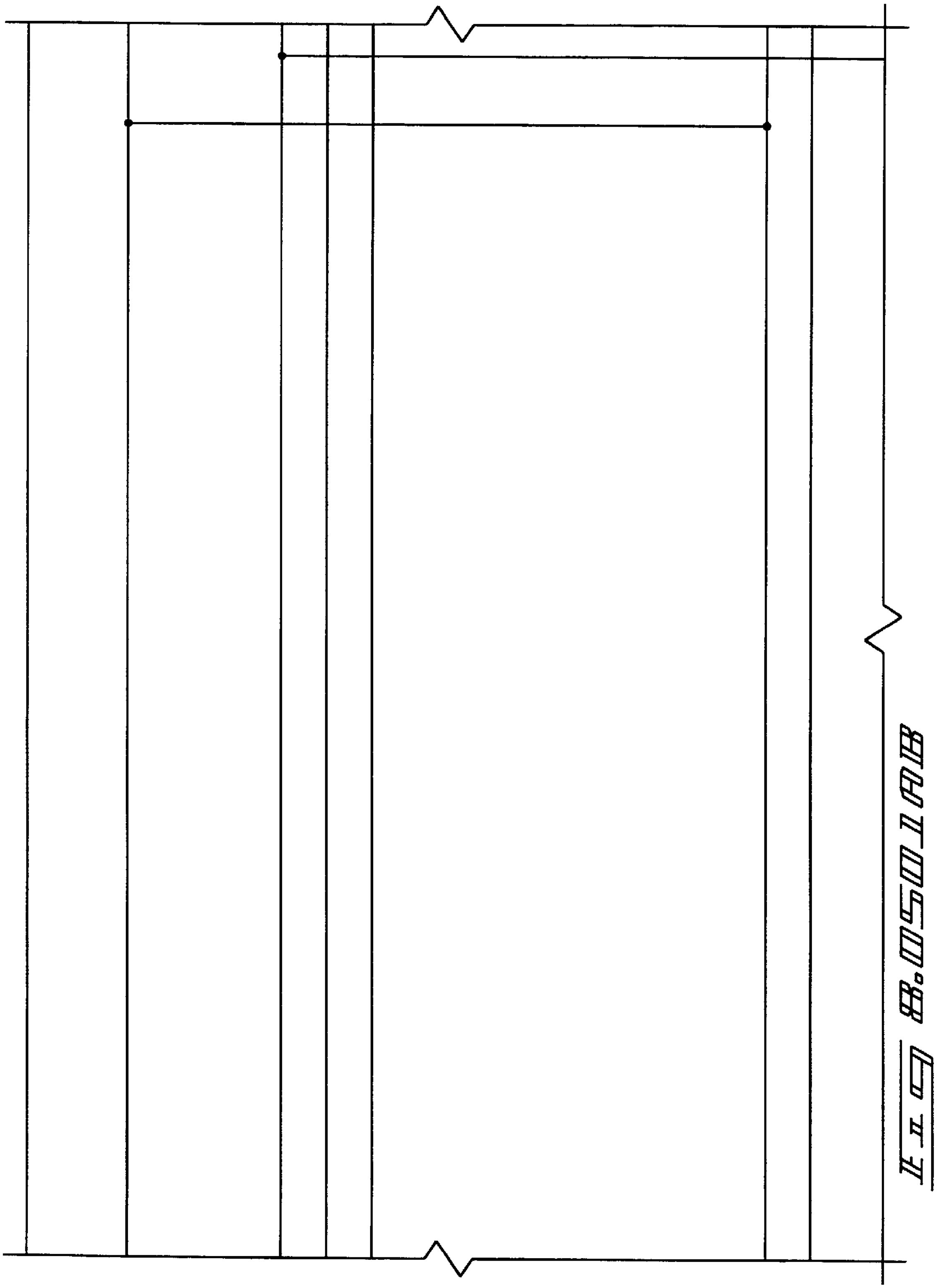
Fig. 8.050.1AB

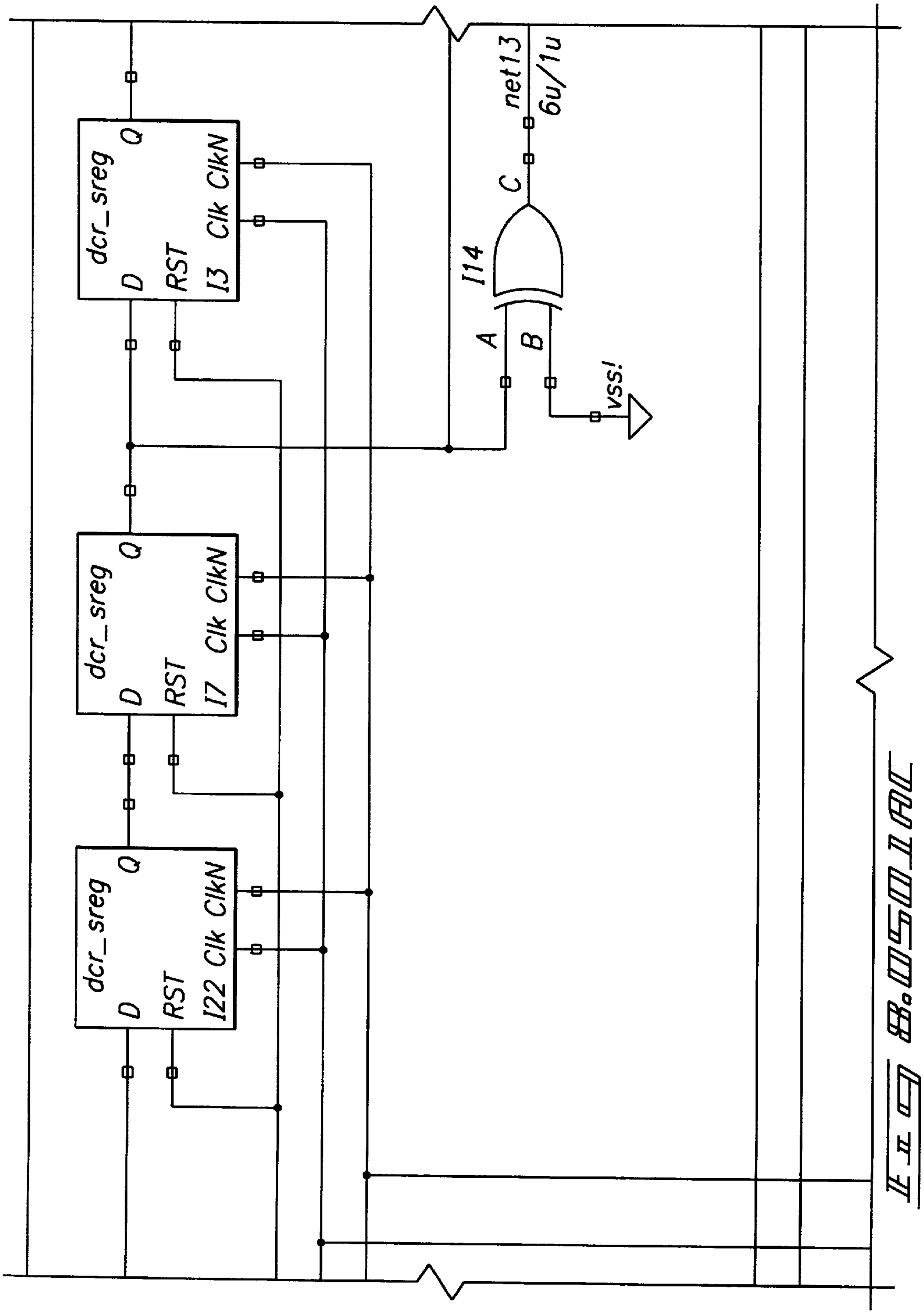
FIG. 8.050.1AC

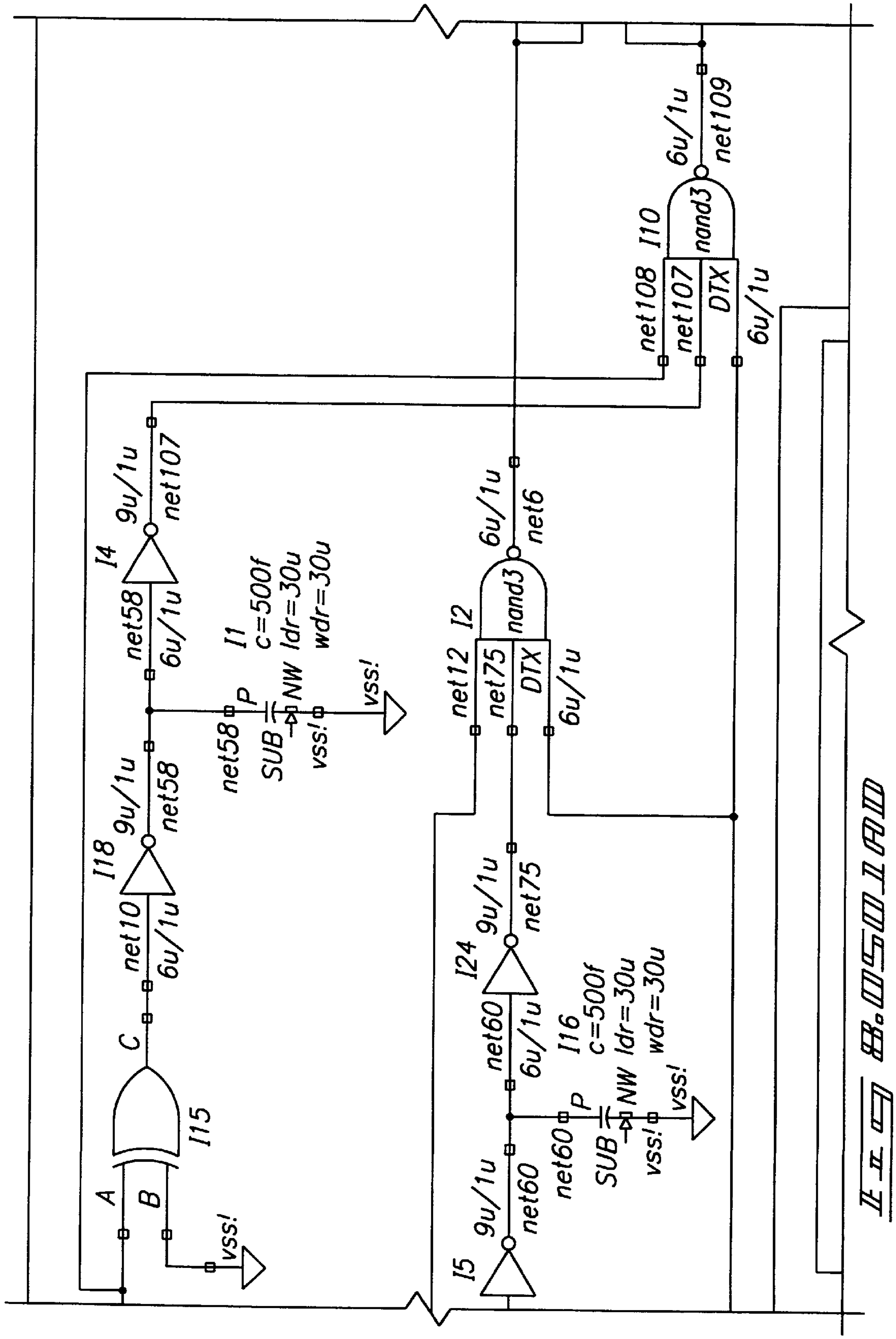
Fig. 8.005I1AD

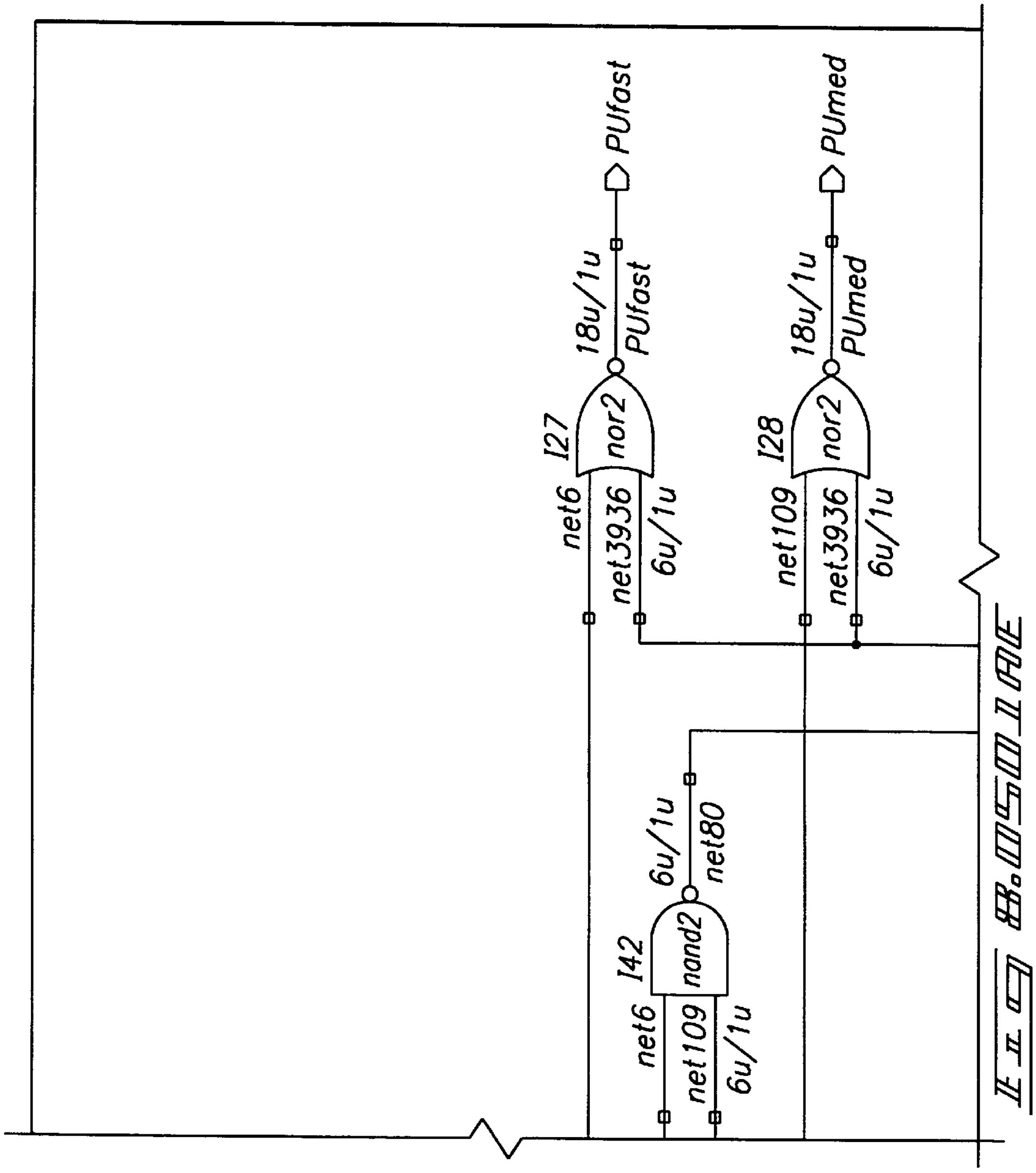
FIG. 8.050.11AE

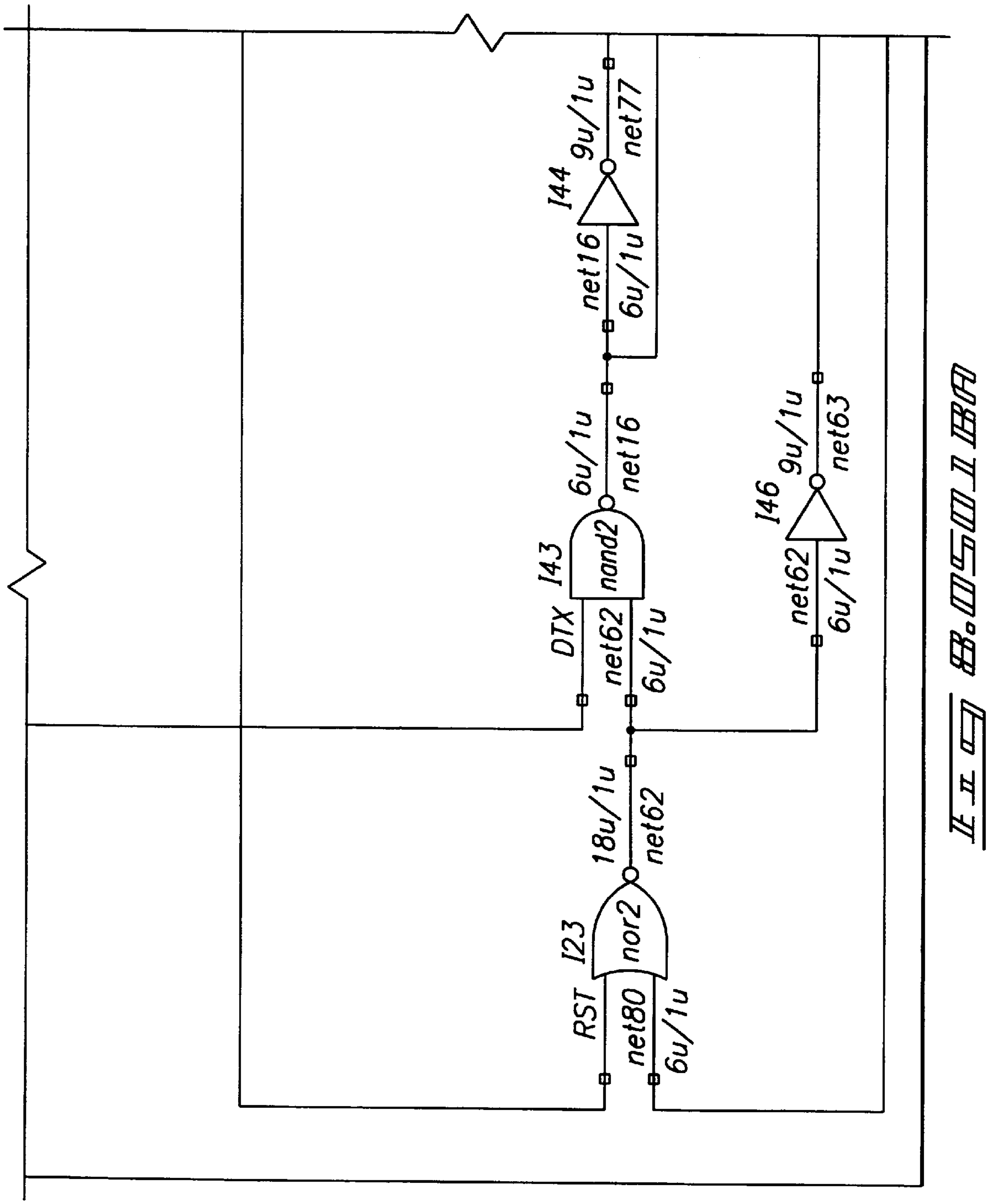
FIG 8.050.1BA

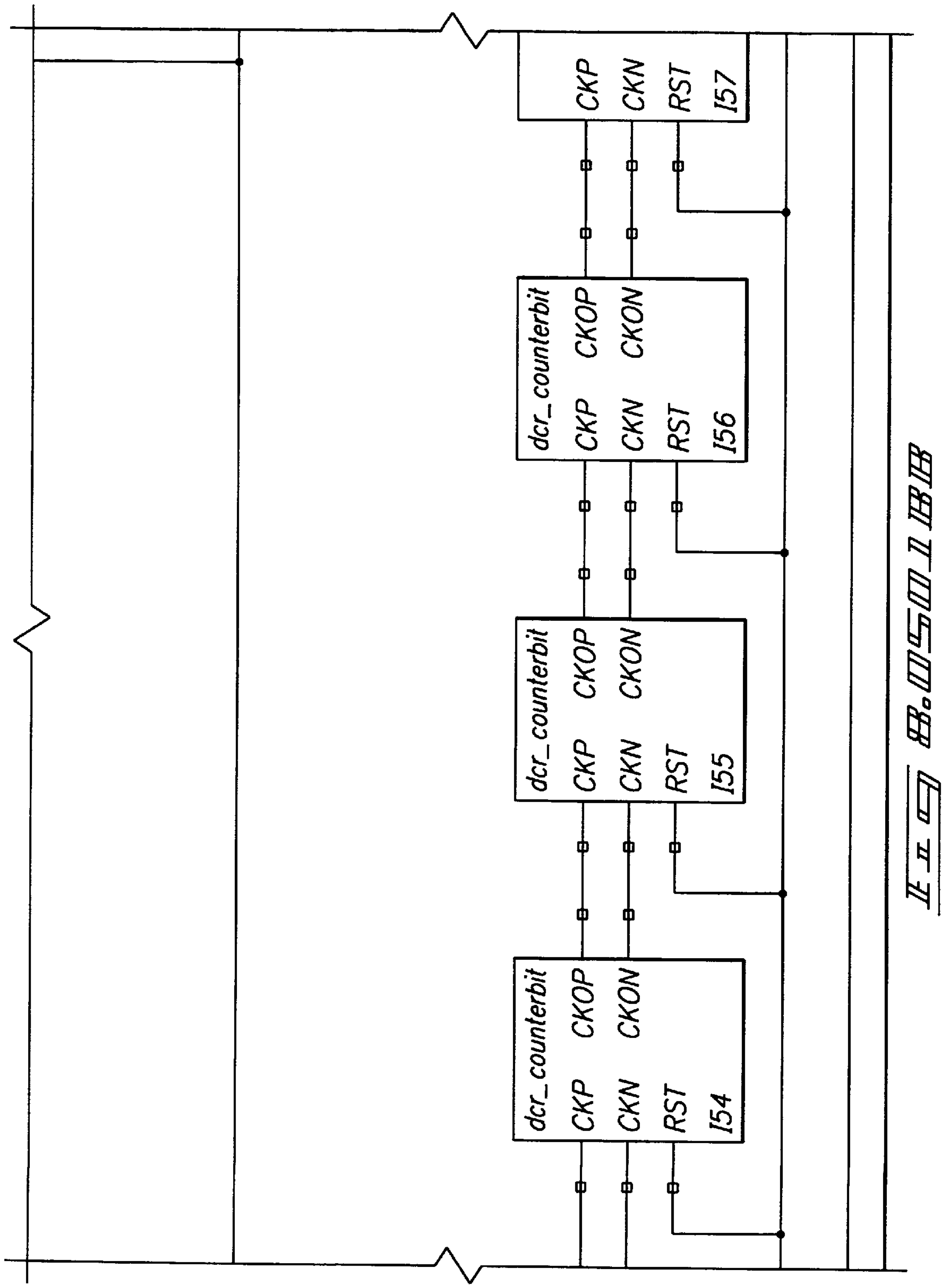
Fig. 8.0501BB

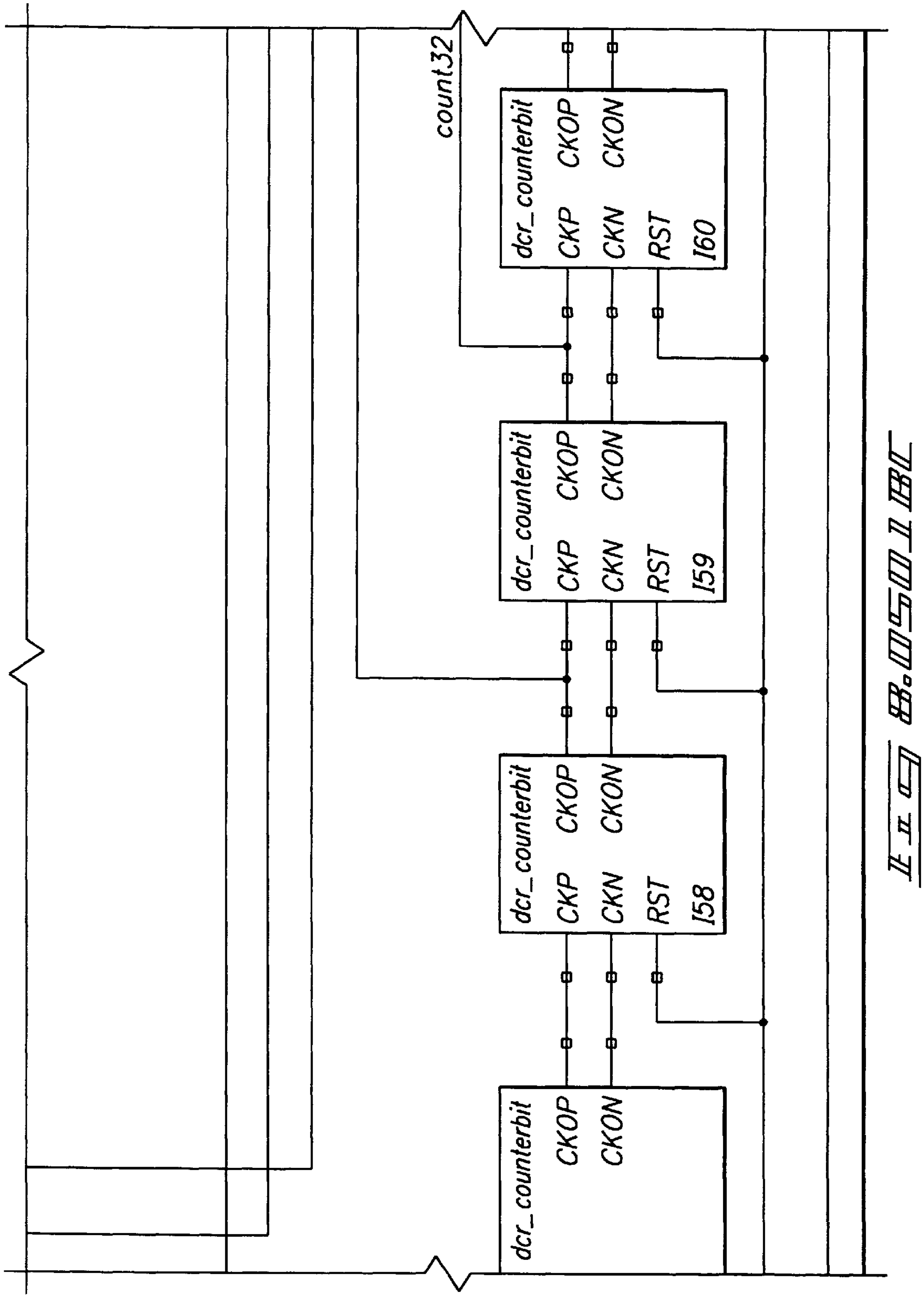
Fig. 8.050.1BC

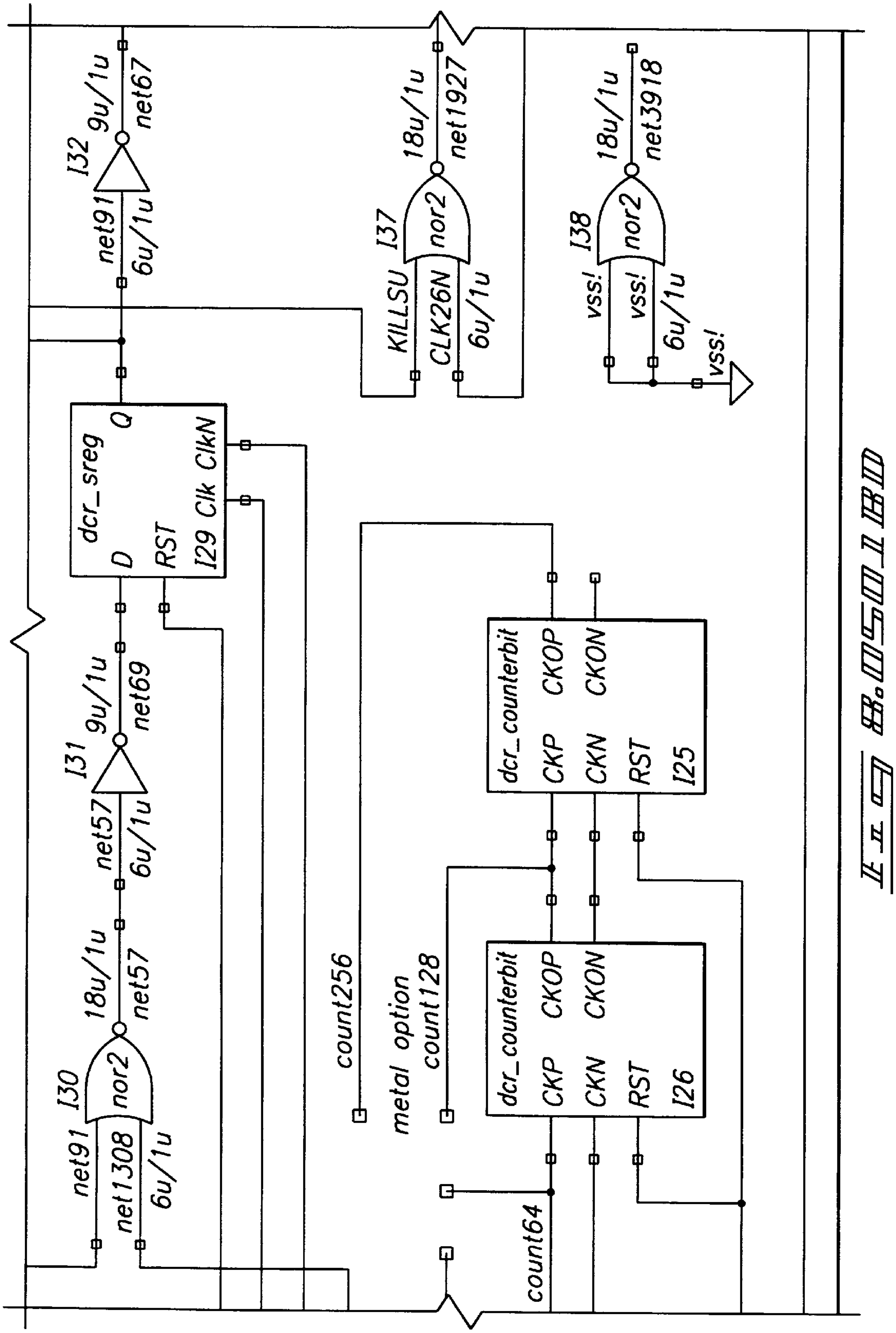
Fig 8.050IBD

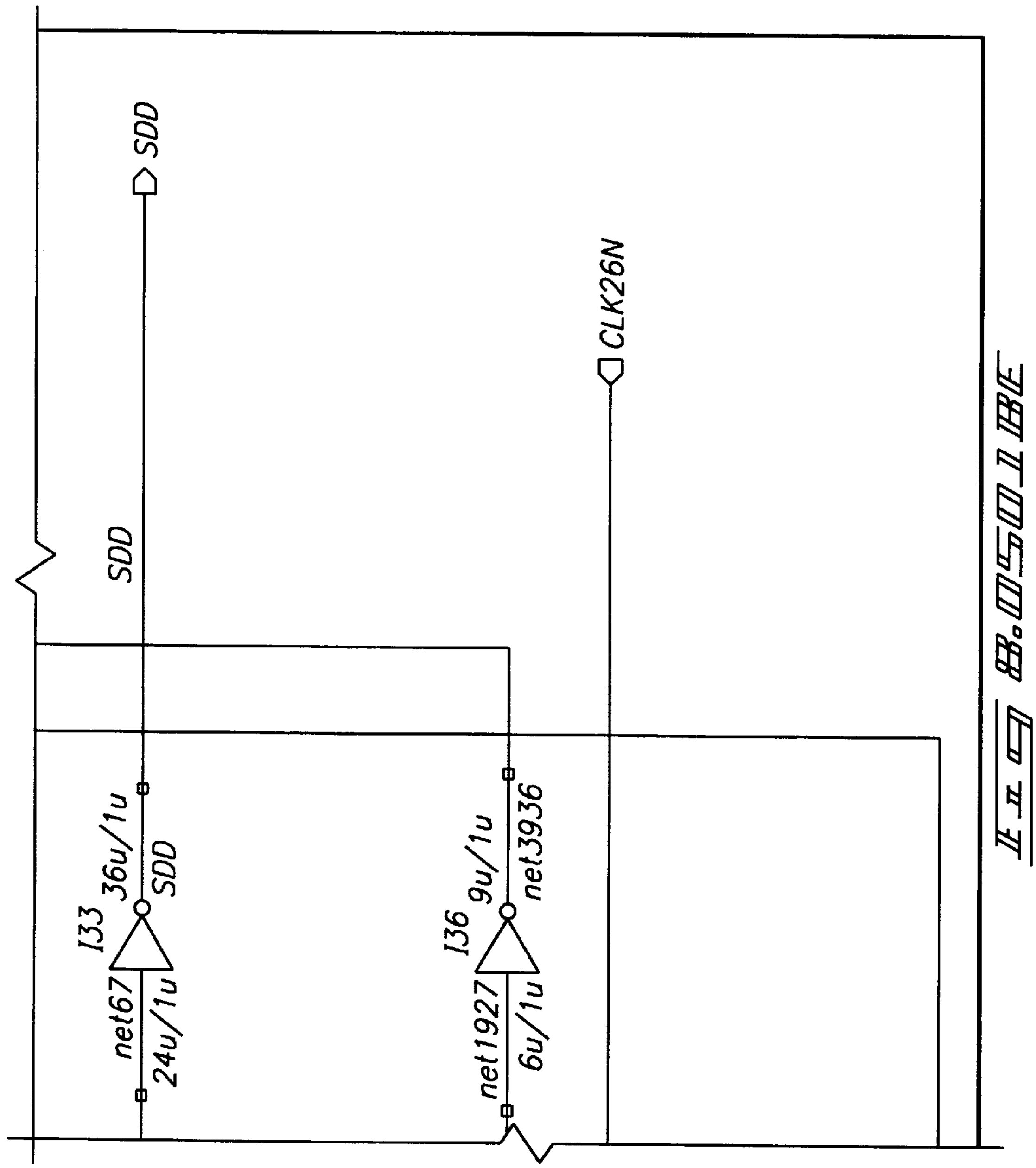
Fig. 8.050.1BE

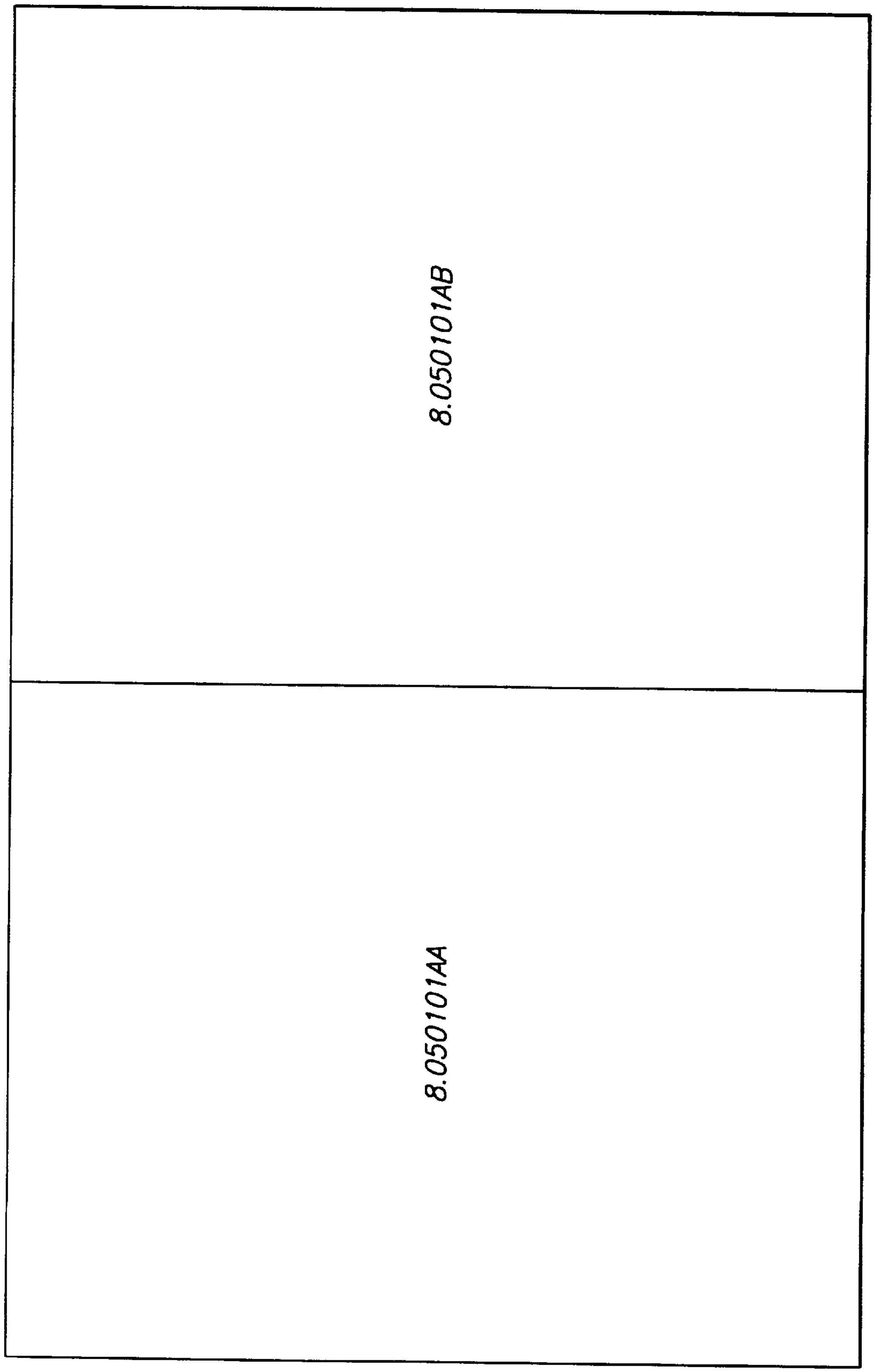
FIG. 8.050101

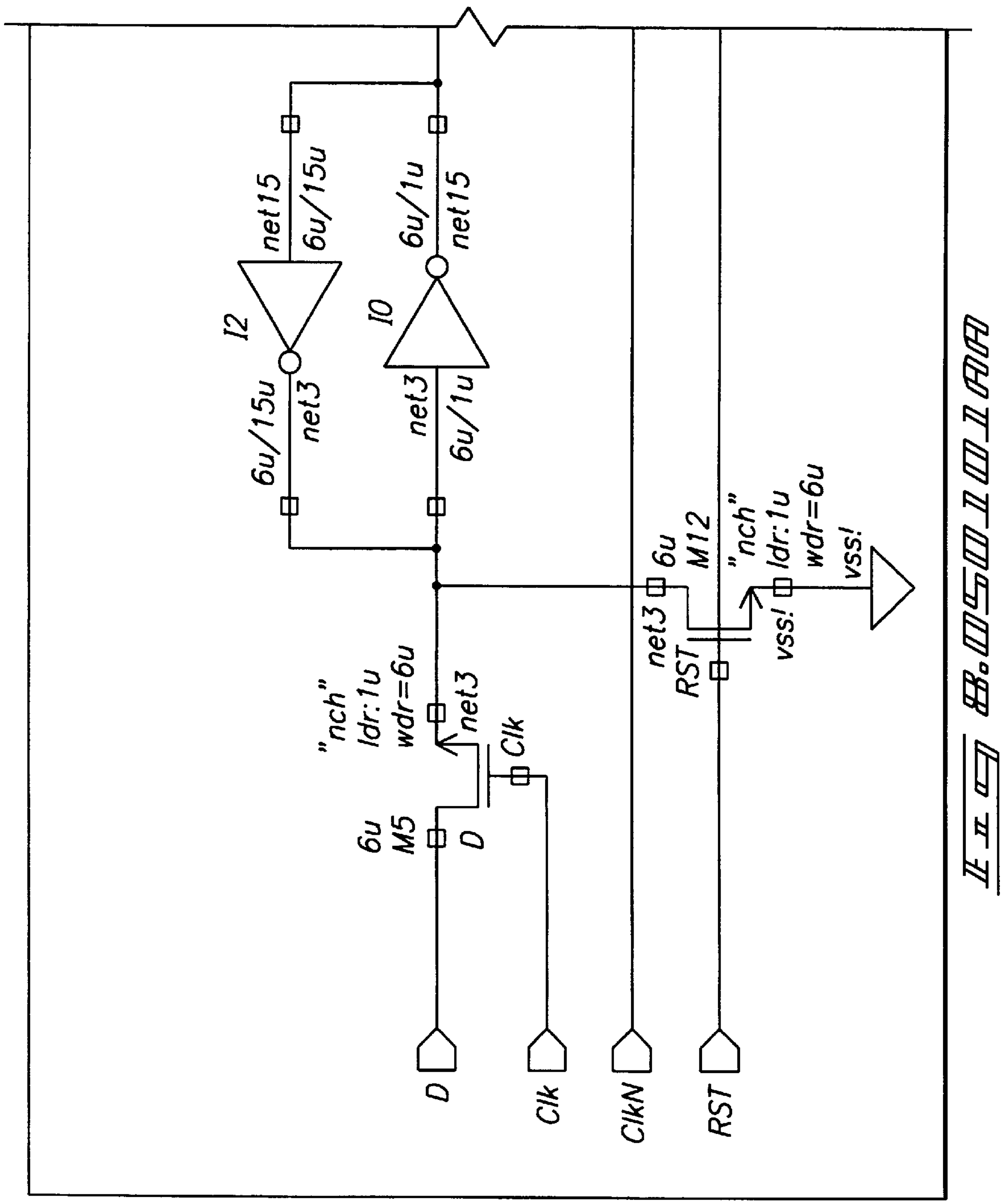
FIG. 8.050101AA

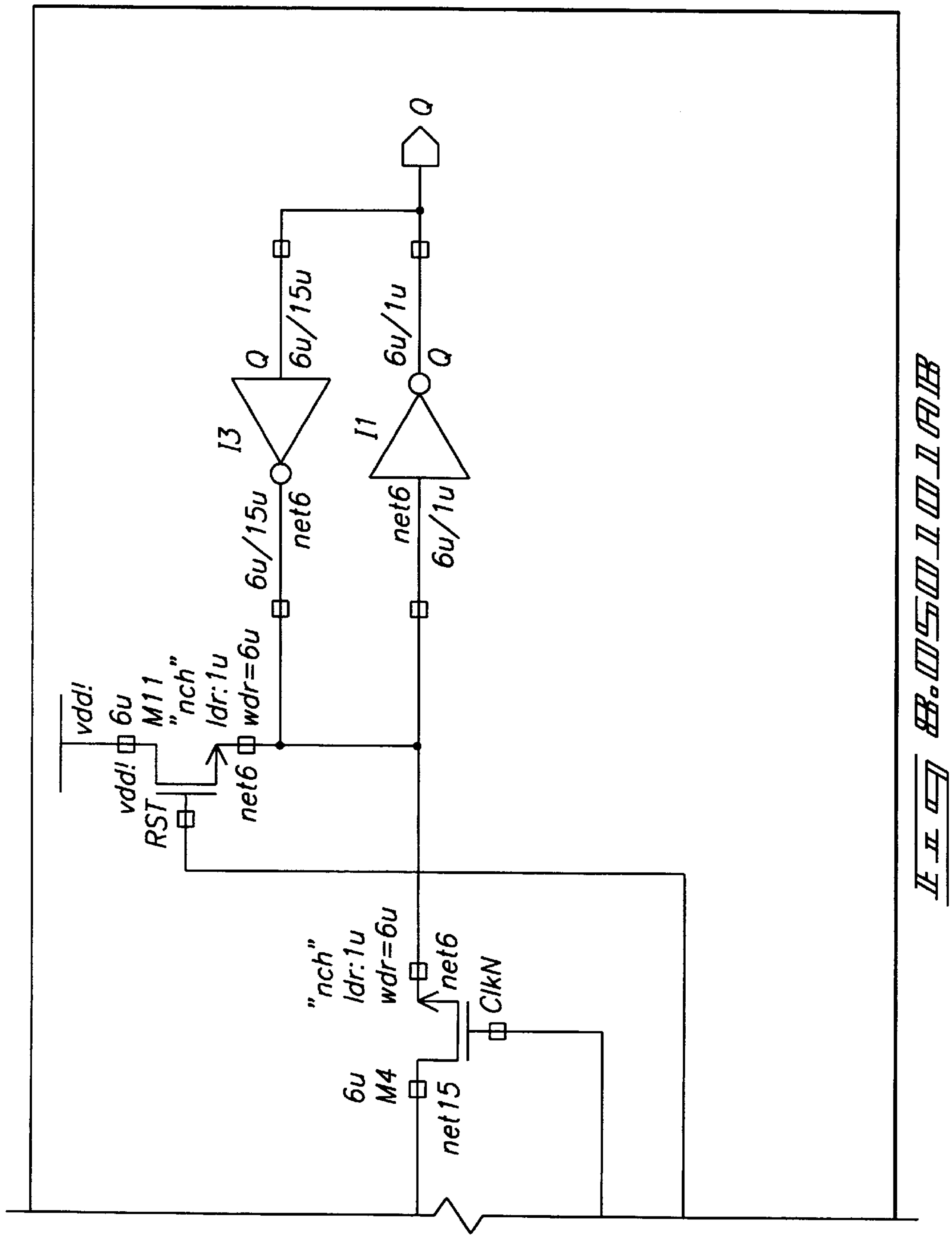
Fig 8.05010AB

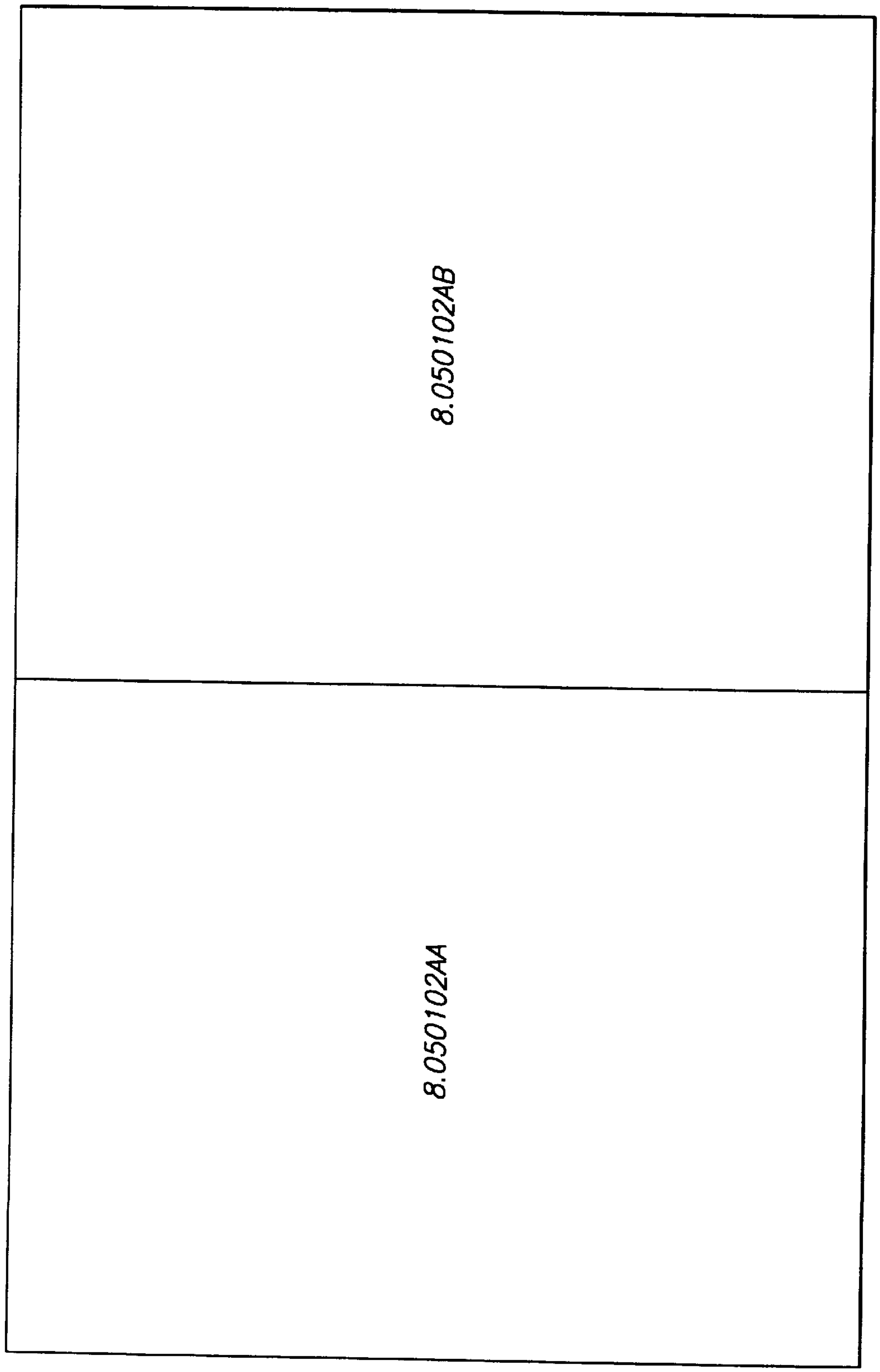
Fig 8.050102

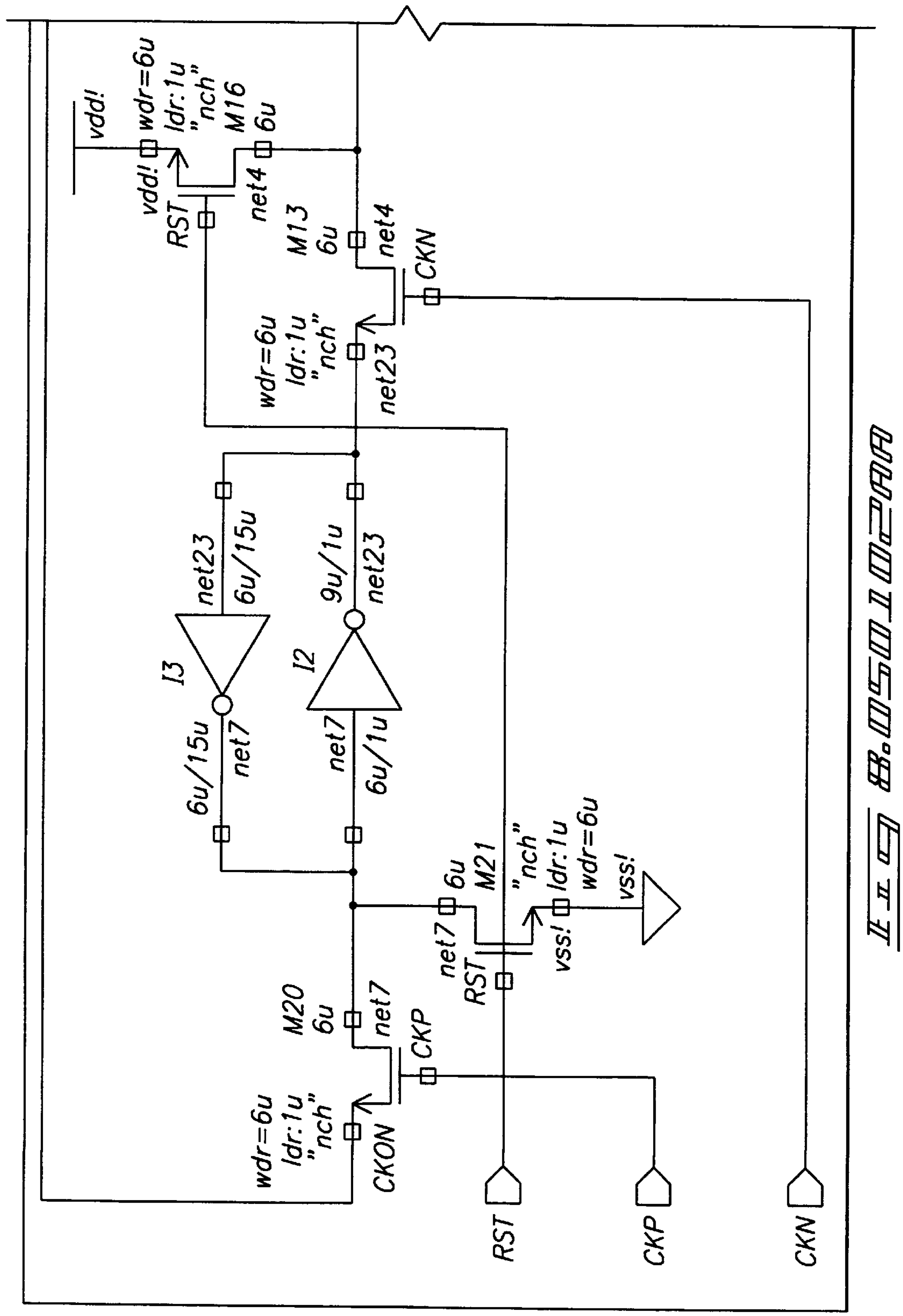
Fig. 8.05010.2AA

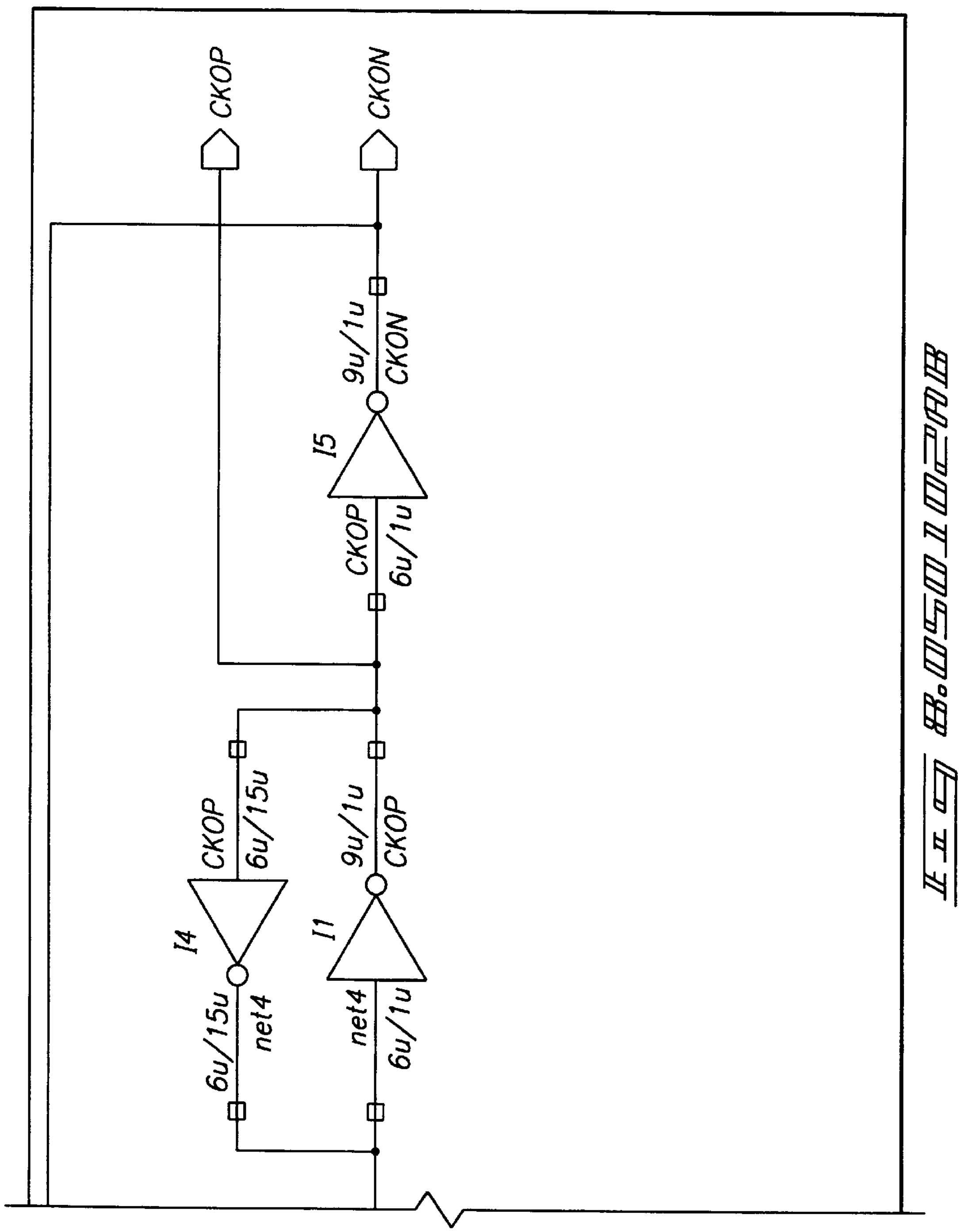
Fig 8.050102AB

| | | | |
|---|---|---|---|
| 8.0502AA | 8.0502AB | 8.0502AC | 8.0502AD |
| 8.0502BA | 8.0502BB | 8.0502BC | 8.0502BD |
| 8.0502CA | 8.0502CB | 8.0502CC | 8.0502CD |

Fig 8.0502

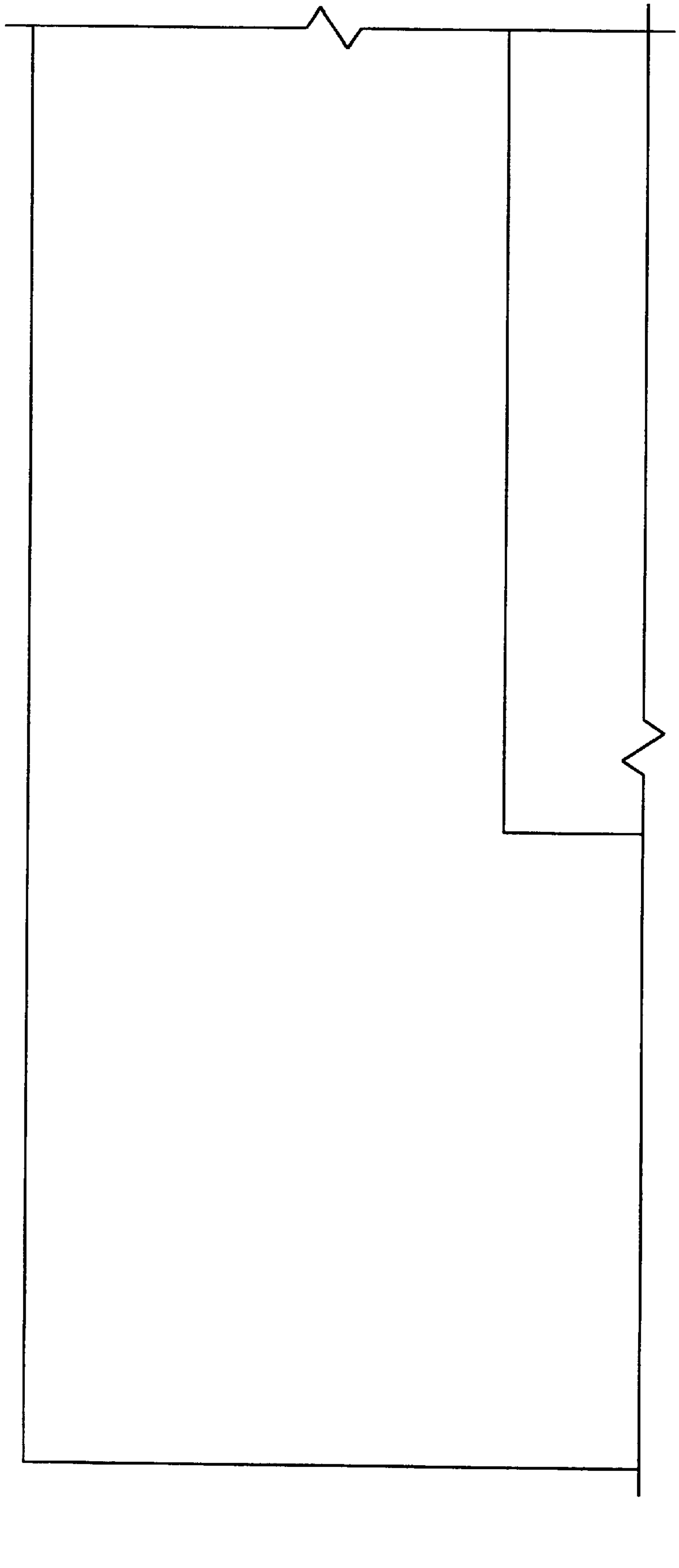
Fig 8.050AA

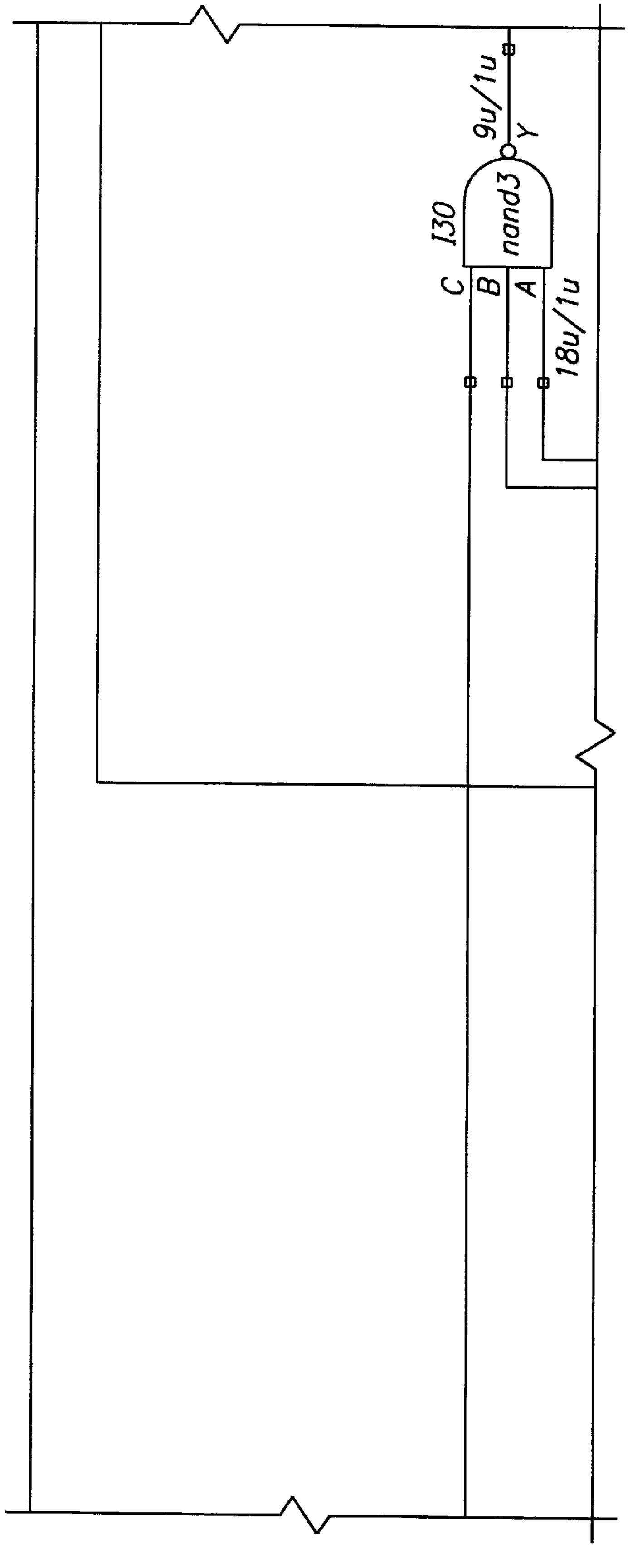
FIG. 8.0502AB

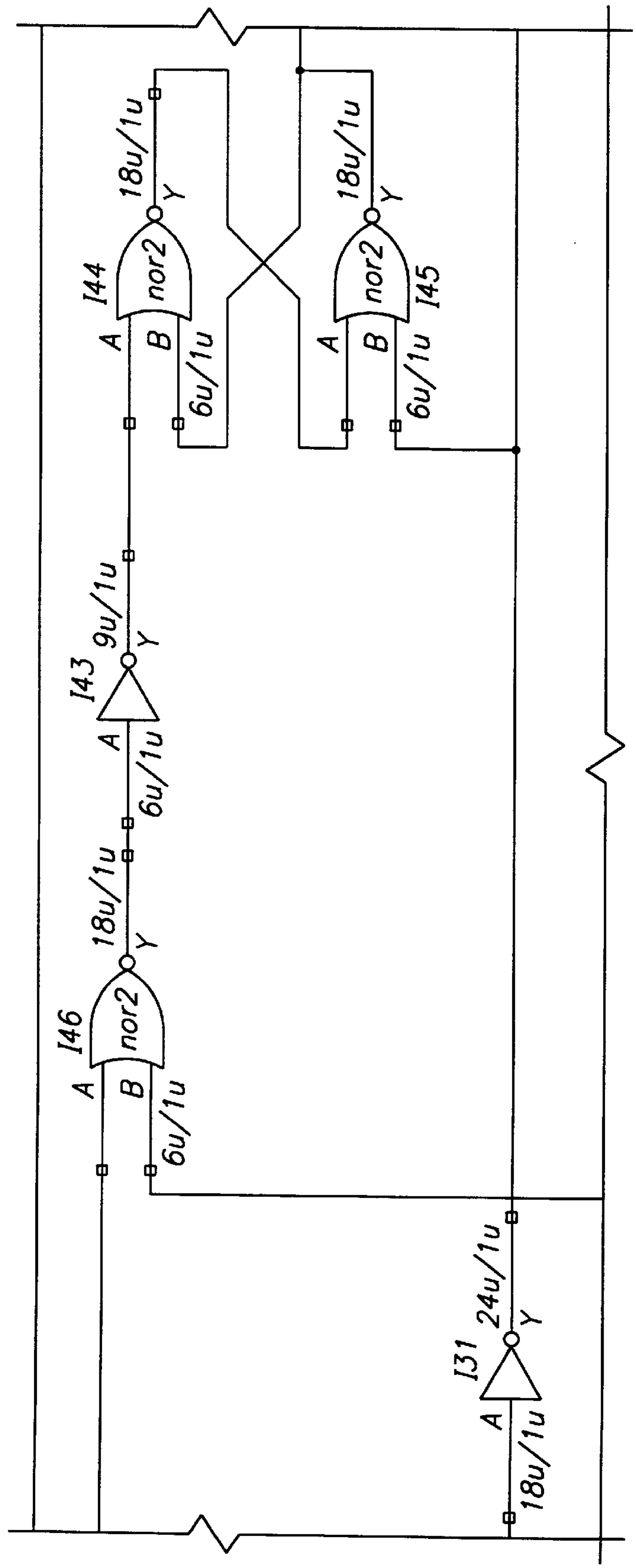
Fig 8.050.2AL

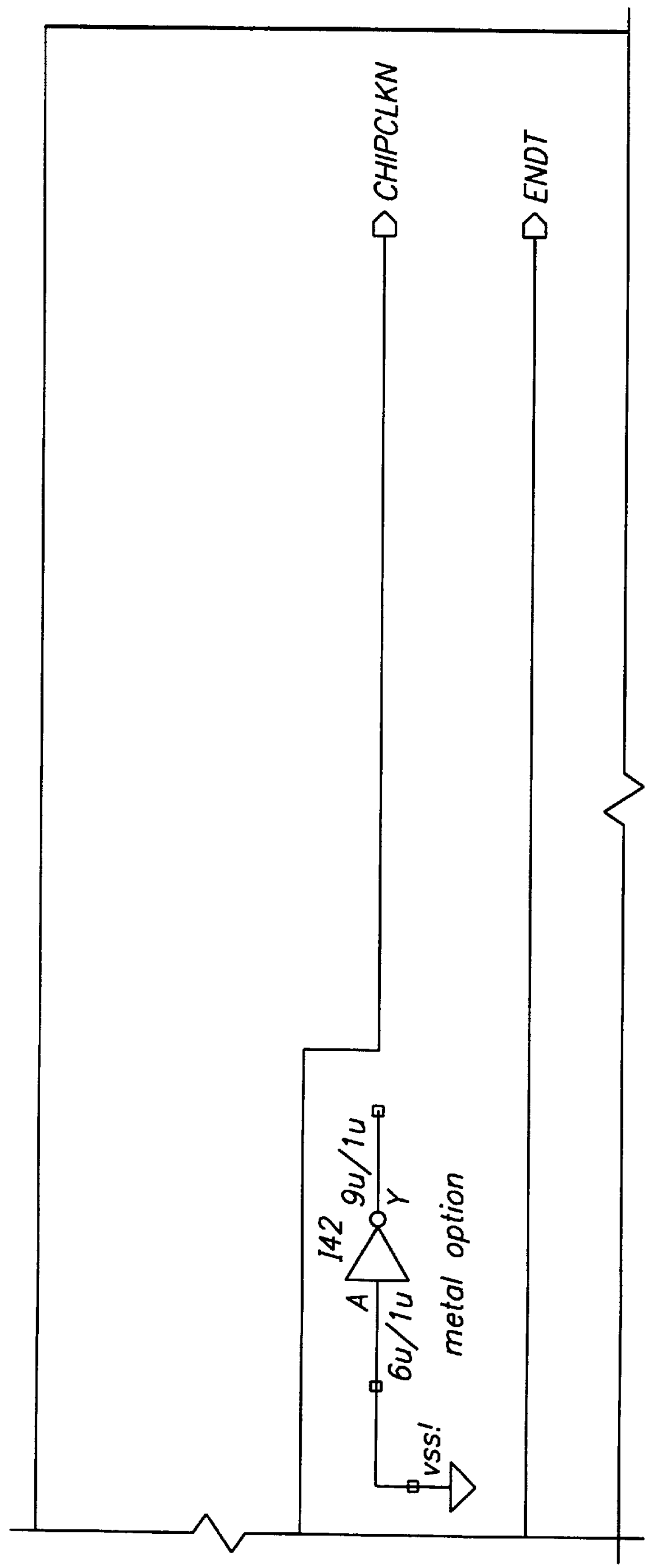
Fig 8.0502AD

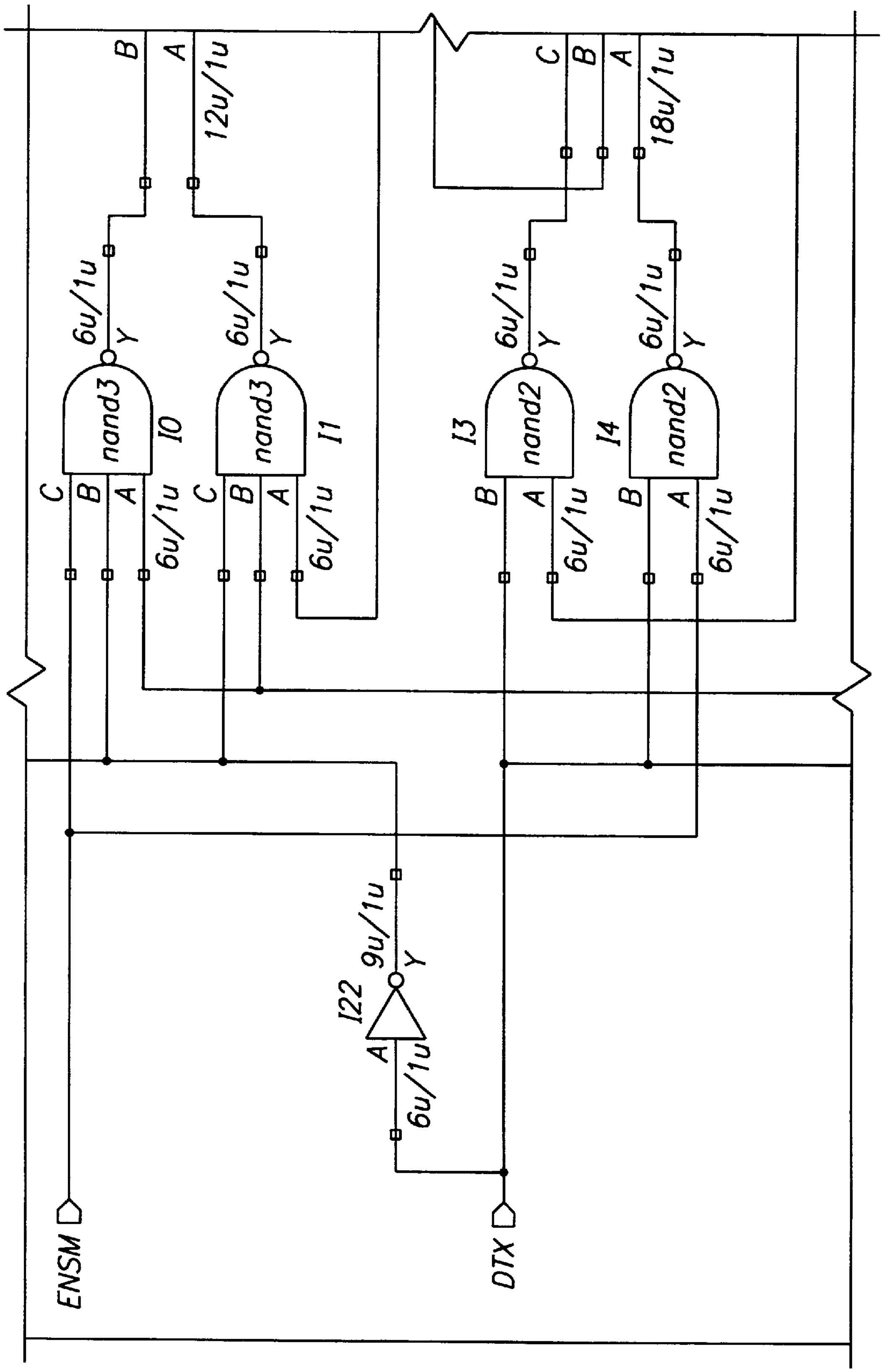
Fig. 8.0502BA

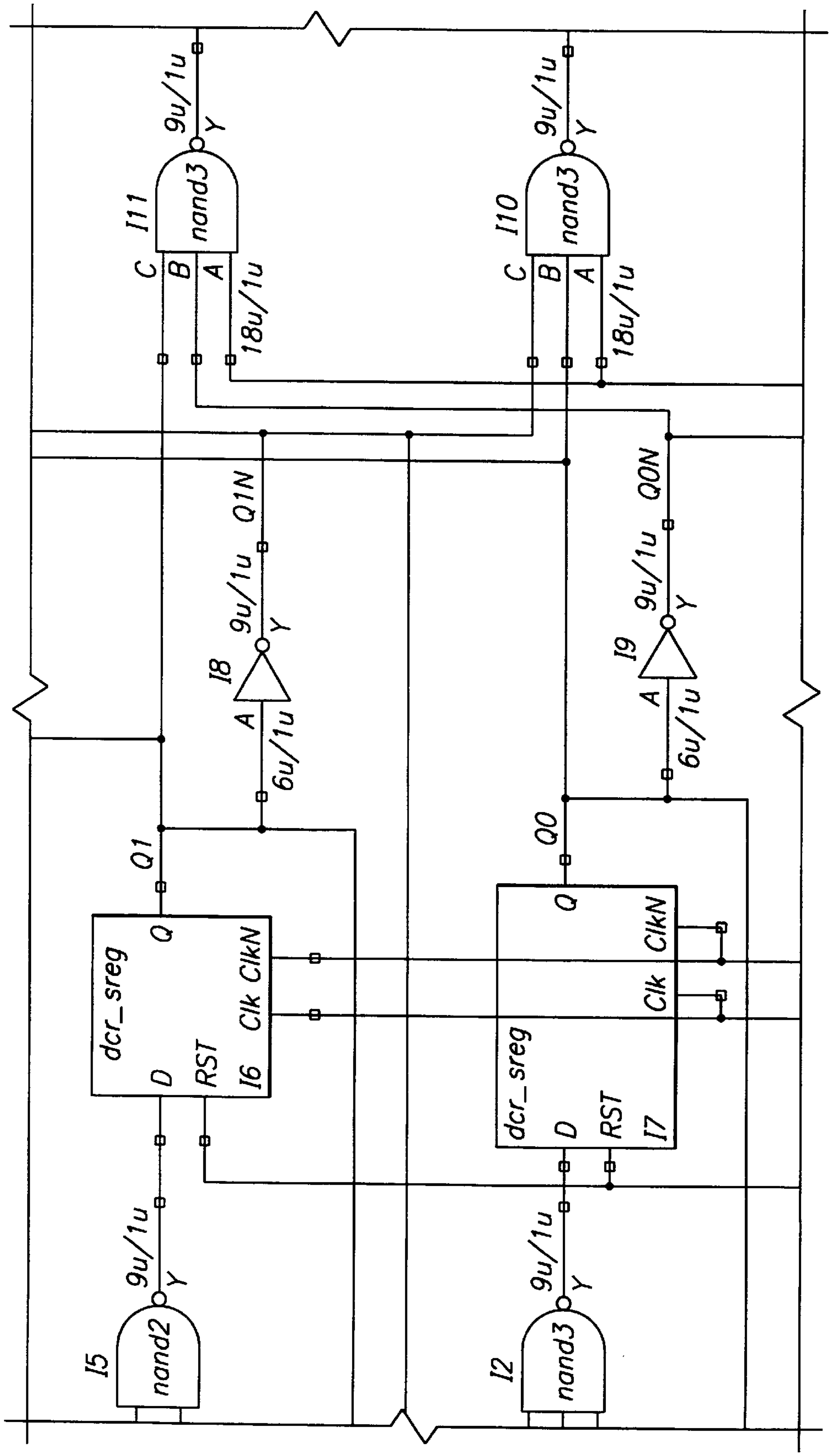
FIG. 8.0502B

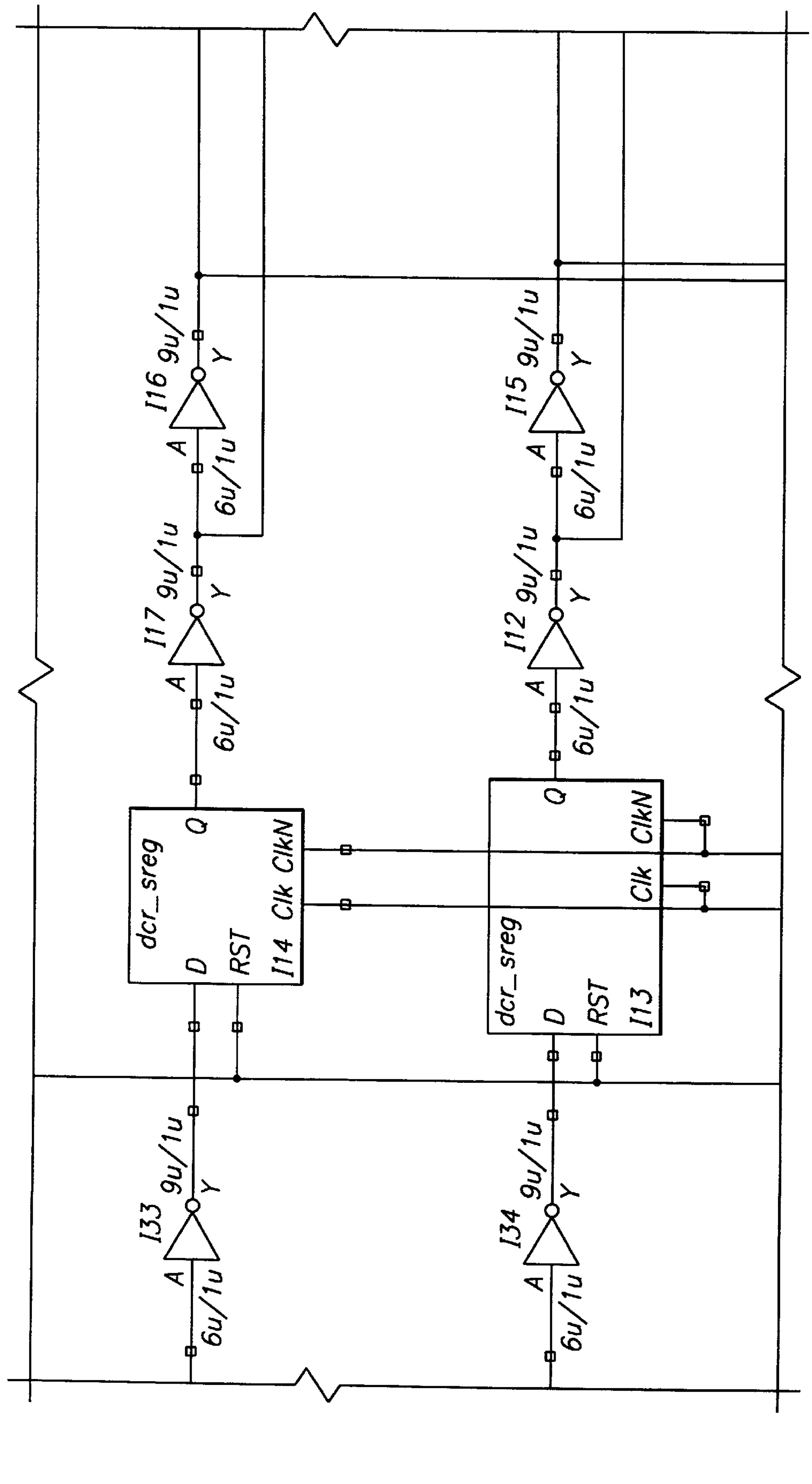
FIG. 8.0502BC

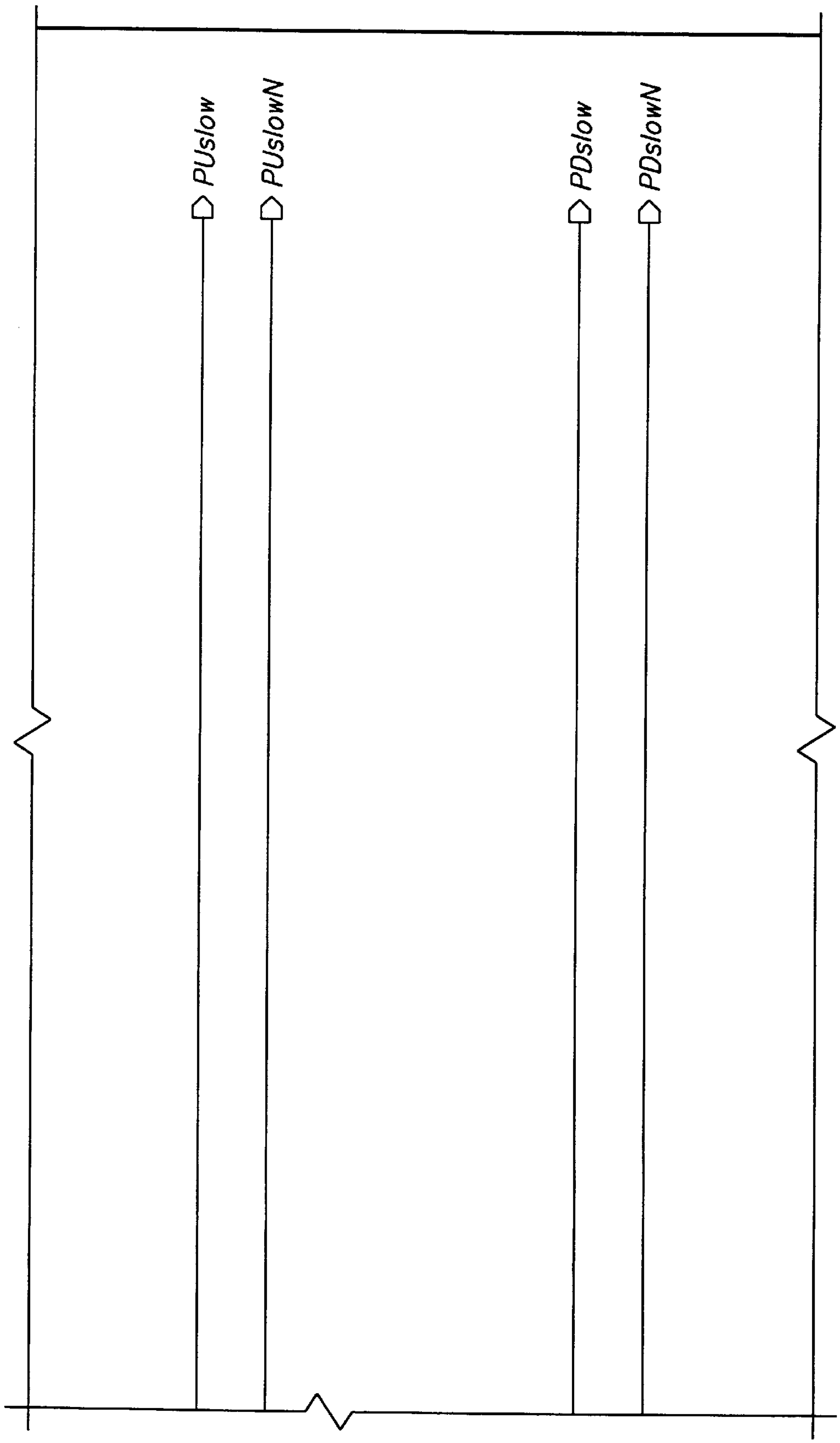
FIG. 8.0502B

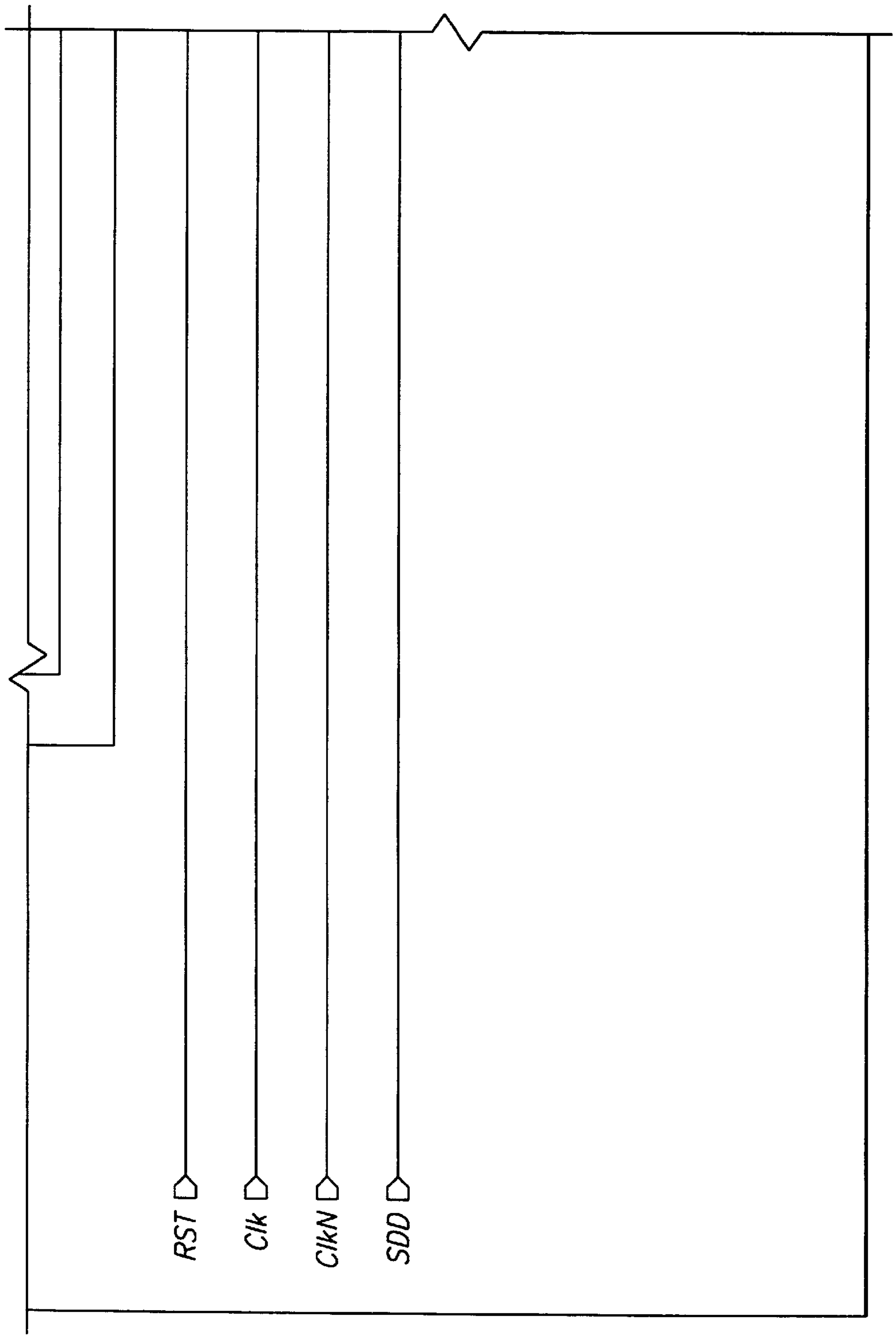
FIG. 8.0502CA

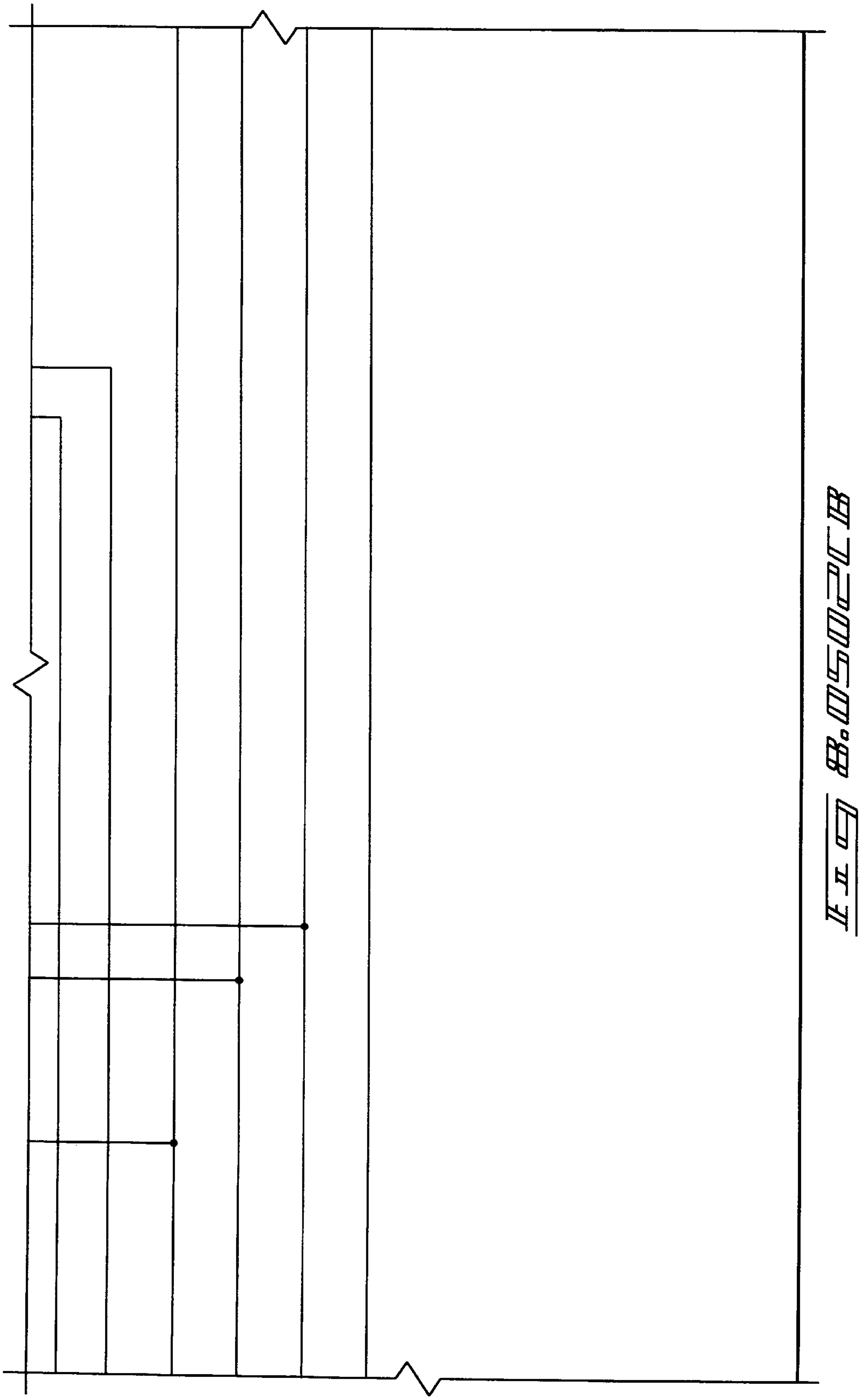
FIG. 8.050.2CB

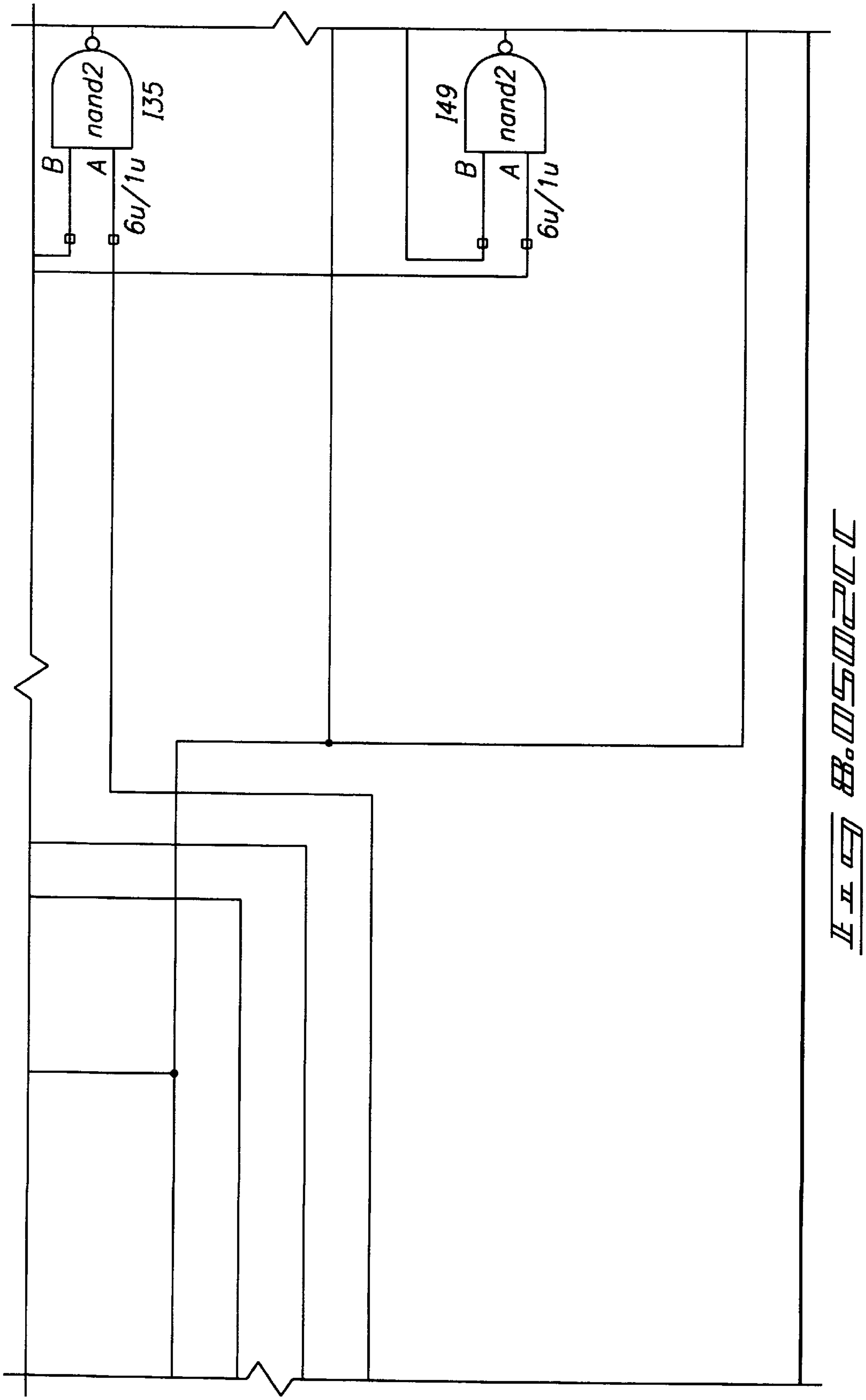
Fig. 8.052CC

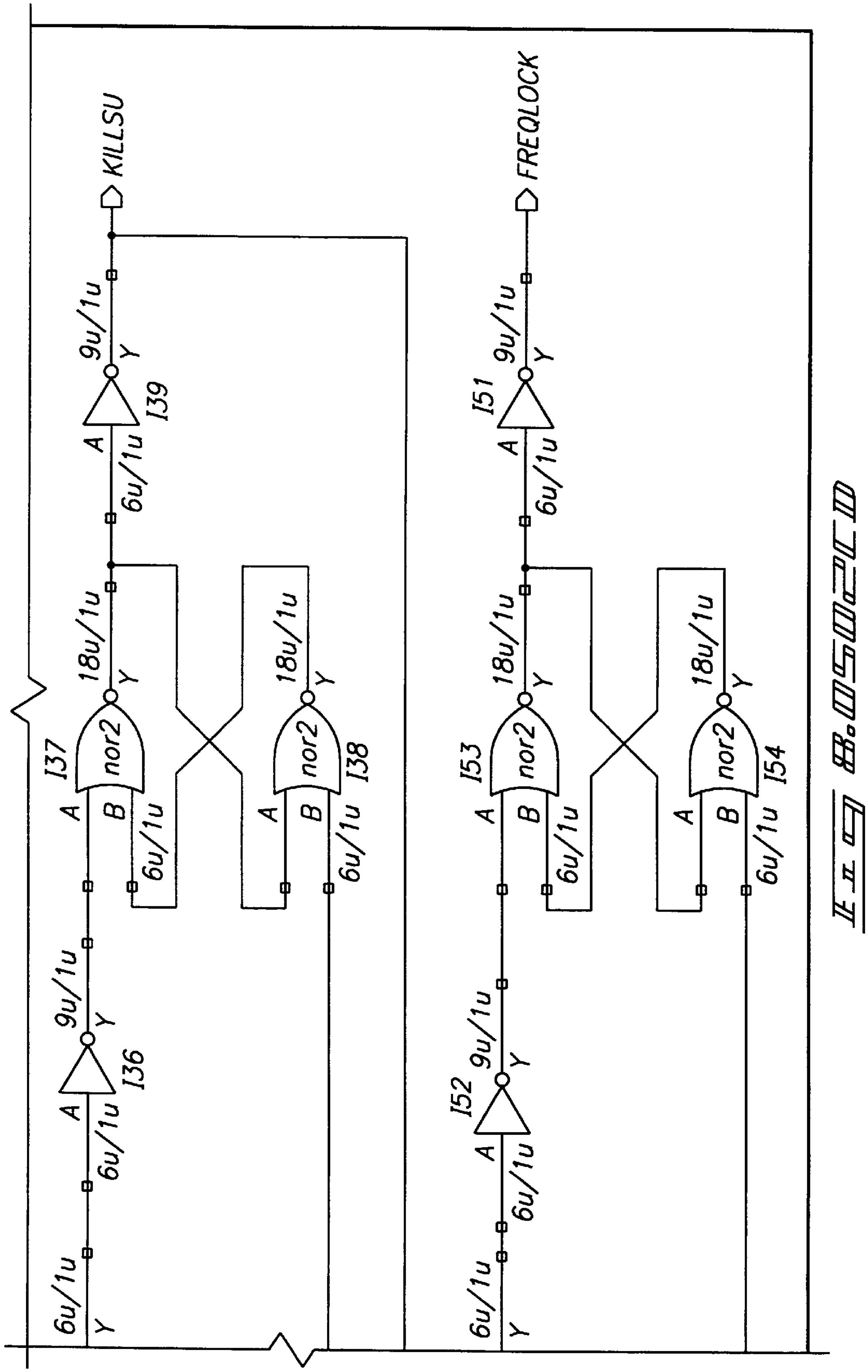
FIG. 8.050.2CD

| | | | | | | | | | | | | | | |
|---|---|---|---|---|---|---|---|---|---|---|---|---|---|---|
| 8.0503AA | 8.0503AB | 8.0503AC | 8.0503AD | 8.0503AE | 8.0503AF | 8.0503AG | 8.0503AH | 8.0503AI | 8.0503AJ | 8.0503AK | 8.0503AL | 8.0503AM | 8.0503AN | 8.0503AO |
| 8.0503BA | 8.0503BB | 8.0503BC | 8.0503BD | 8.0503BE | 8.0503BF | 8.0503BG | 8.0503BH | 8.0503BI | 8.0503BJ | 8.0503BK | 8.0503BL | 8.0503BM | 8.0503BN | 8.0503BO |
| 8.0503CA | 8.0503CB | 8.0503CC | 8.0503CD | 8.0503CE | 8.0503CF | 8.0503CG | 8.0503CH | 8.0503CI | 8.0503CJ | 8.0503CK | 8.0503CL | 8.0503CM | 8.0503CN | 8.0503CO |
| 8.0503DA | 8.0503DB | 8.0503DC | 8.0503DD | 8.0503DE | 8.0503DF | 8.0503DG | 8.0503DH | 8.0503DI | 8.0503DJ | 8.0503DK | 8.0503DL | 8.0503DM | 8.0503DN | 8.0503DO |
| 8.0503EA | 8.0503EB | 8.0503EC | 8.0503ED | 8.0503EE | 8.0503EF | 8.0503EG | 8.0503EH | 8.0503EI | 8.0503EJ | 8.0503EK | 8.0503EL | 8.0503EM | 8.0503EN | |
| 8.0503FA | 8.0503FB | 8.0503FC | 8.0503FD | 8.0503FE | 8.0503FF | 8.0503FG | 8.0503FH | 8.0503FI | 8.0503FJ | 8.0503FK | 8.0503FL | 8.0503FM | 8.0503FN | |

FIG 8.0503

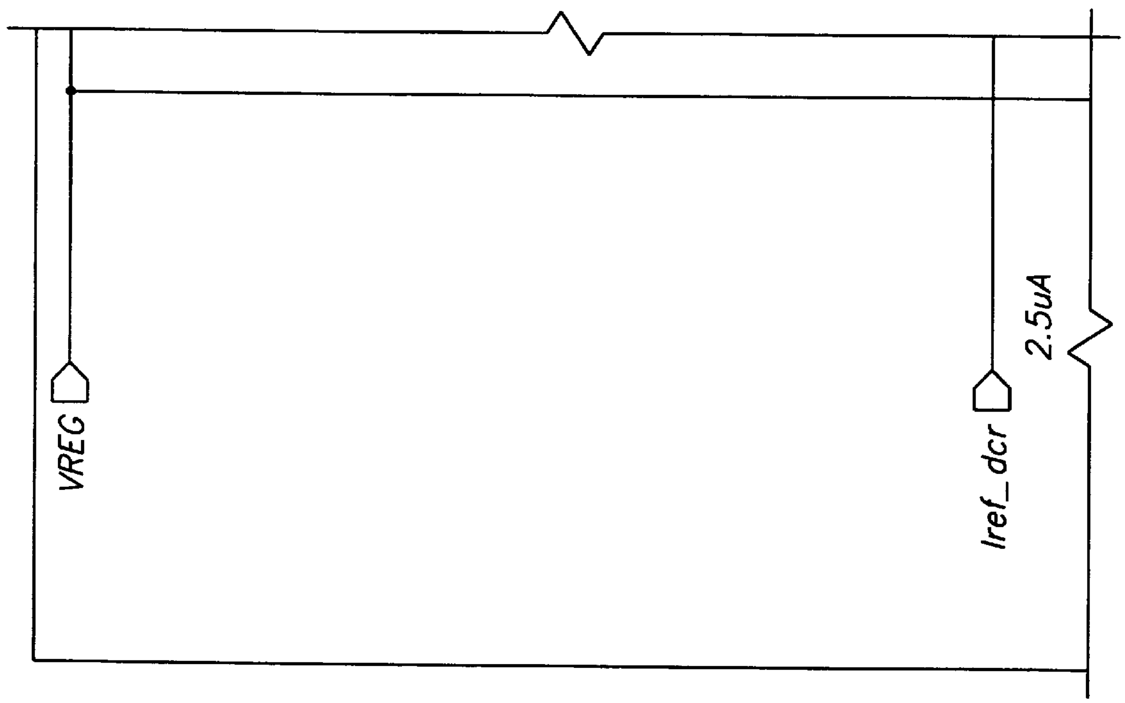
FIG. 8.0503AA

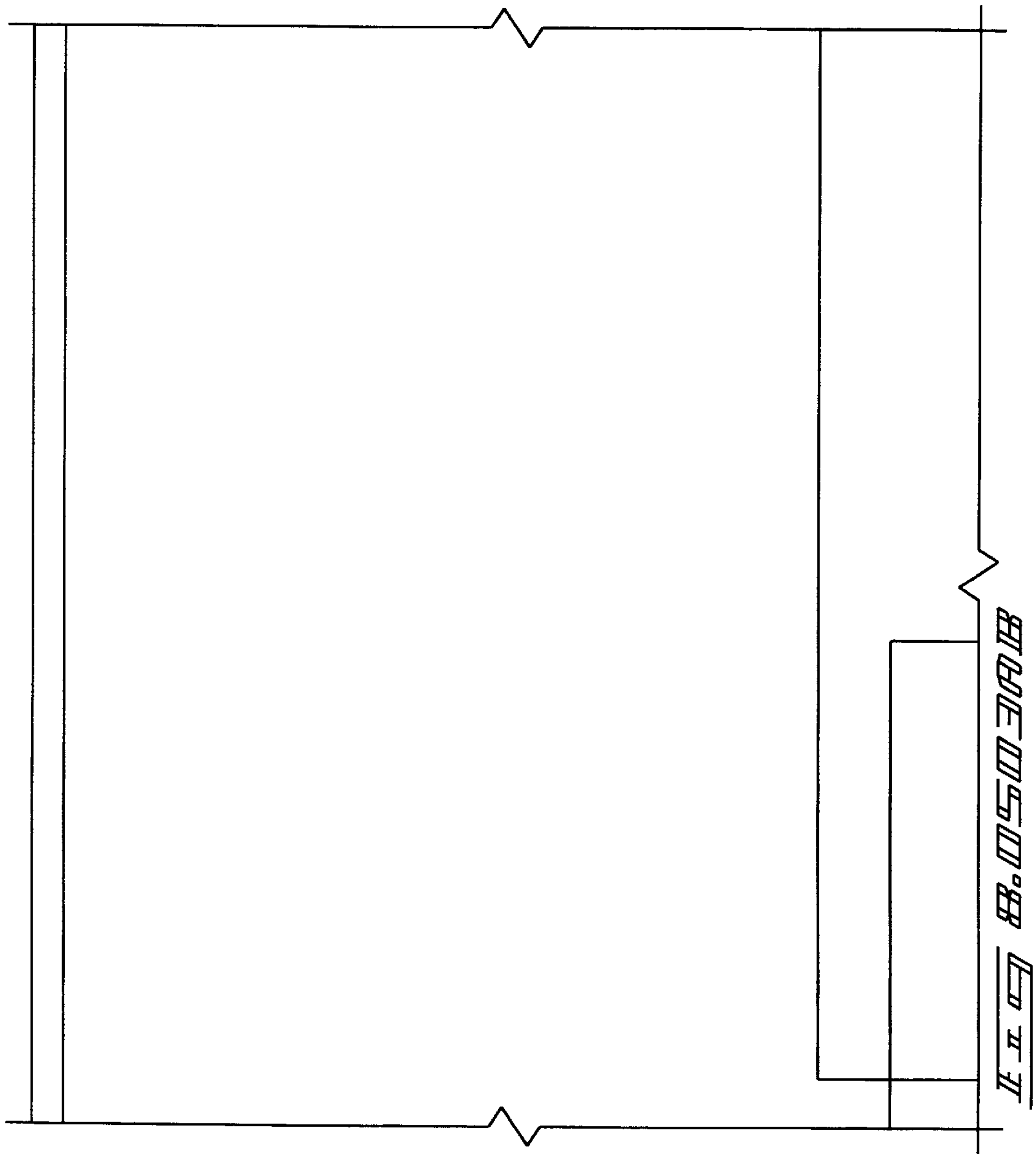
FIG. 8.05034B

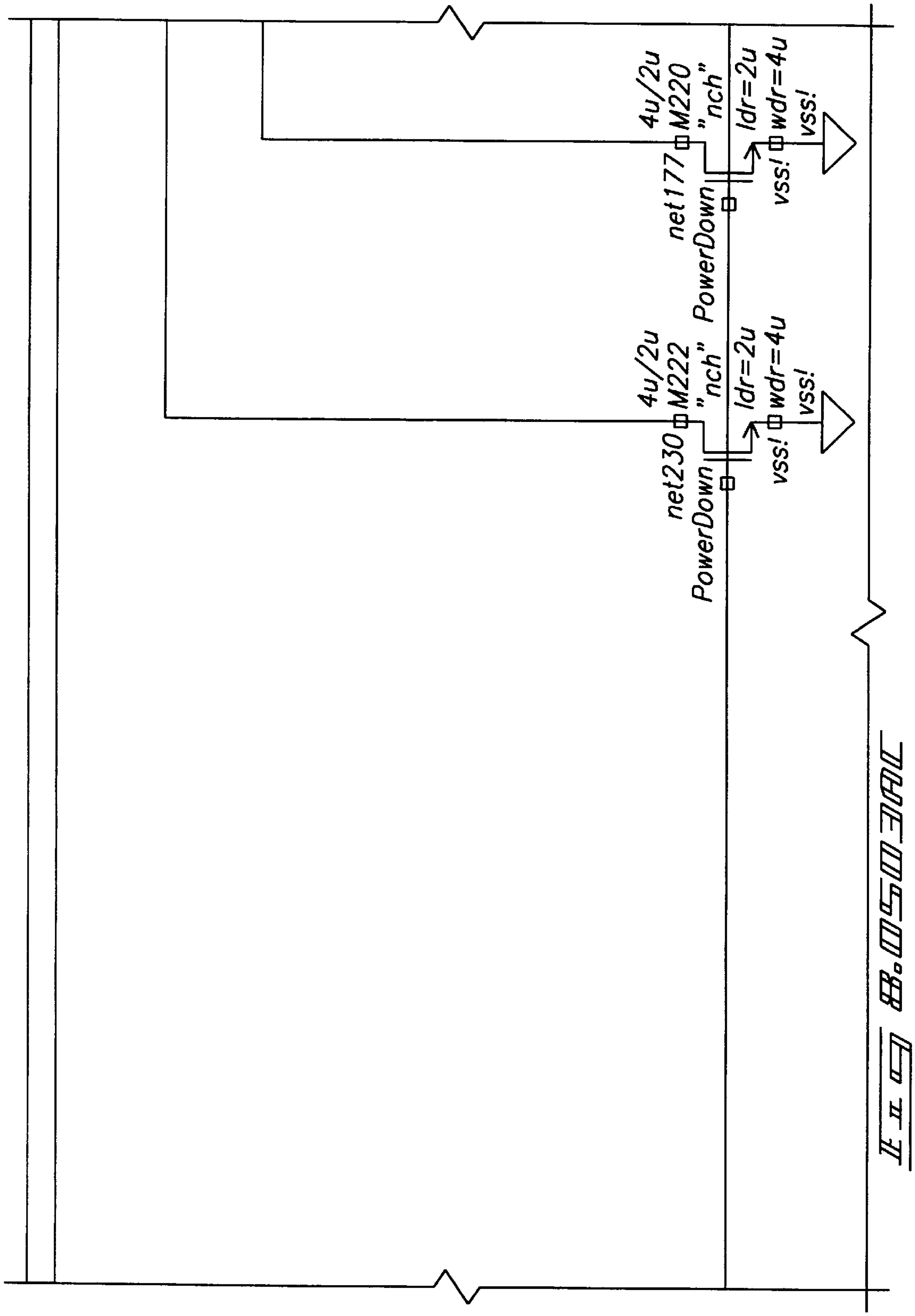
FIG. 8.0503AJ

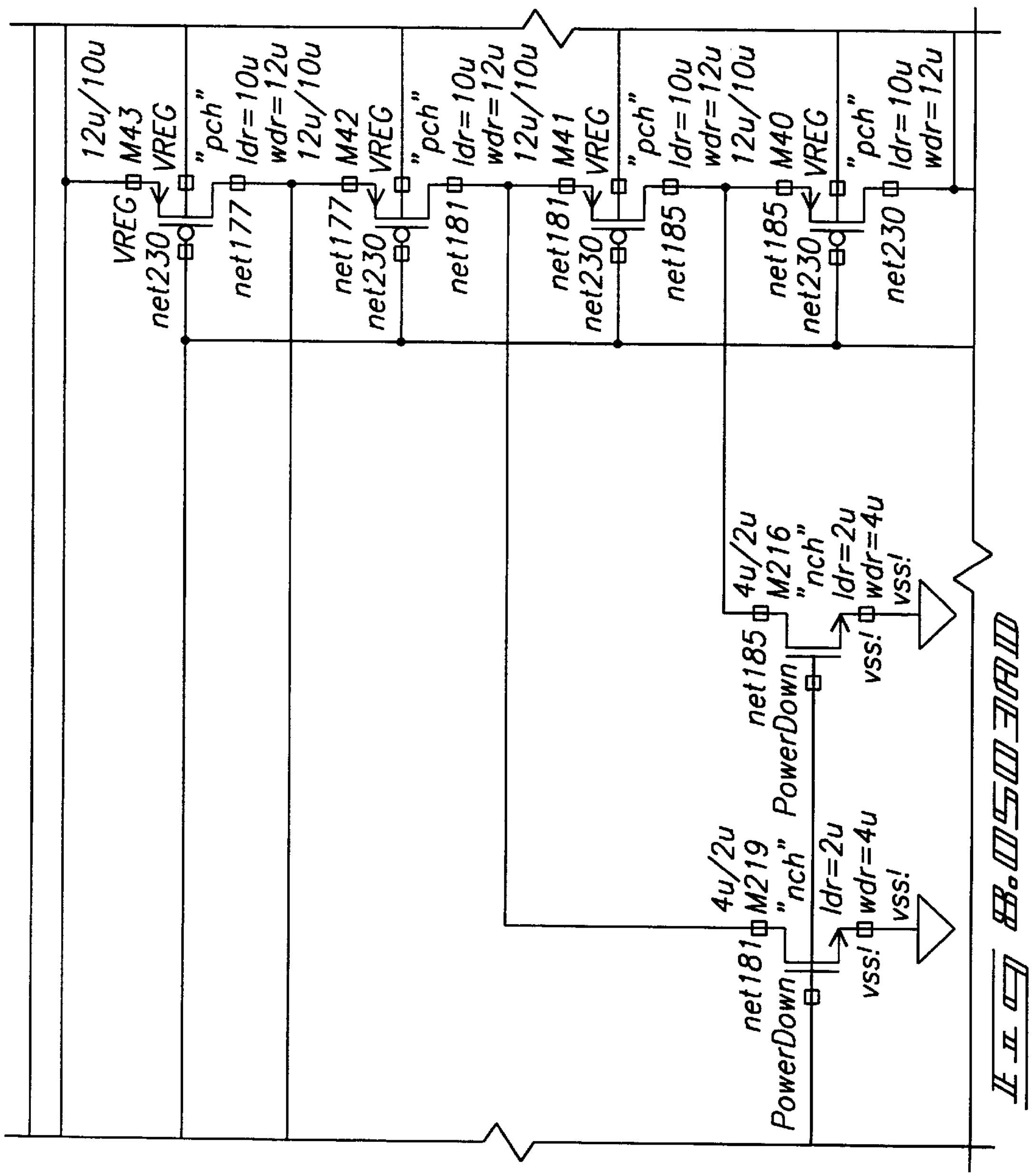
FIG. 8.050AAD

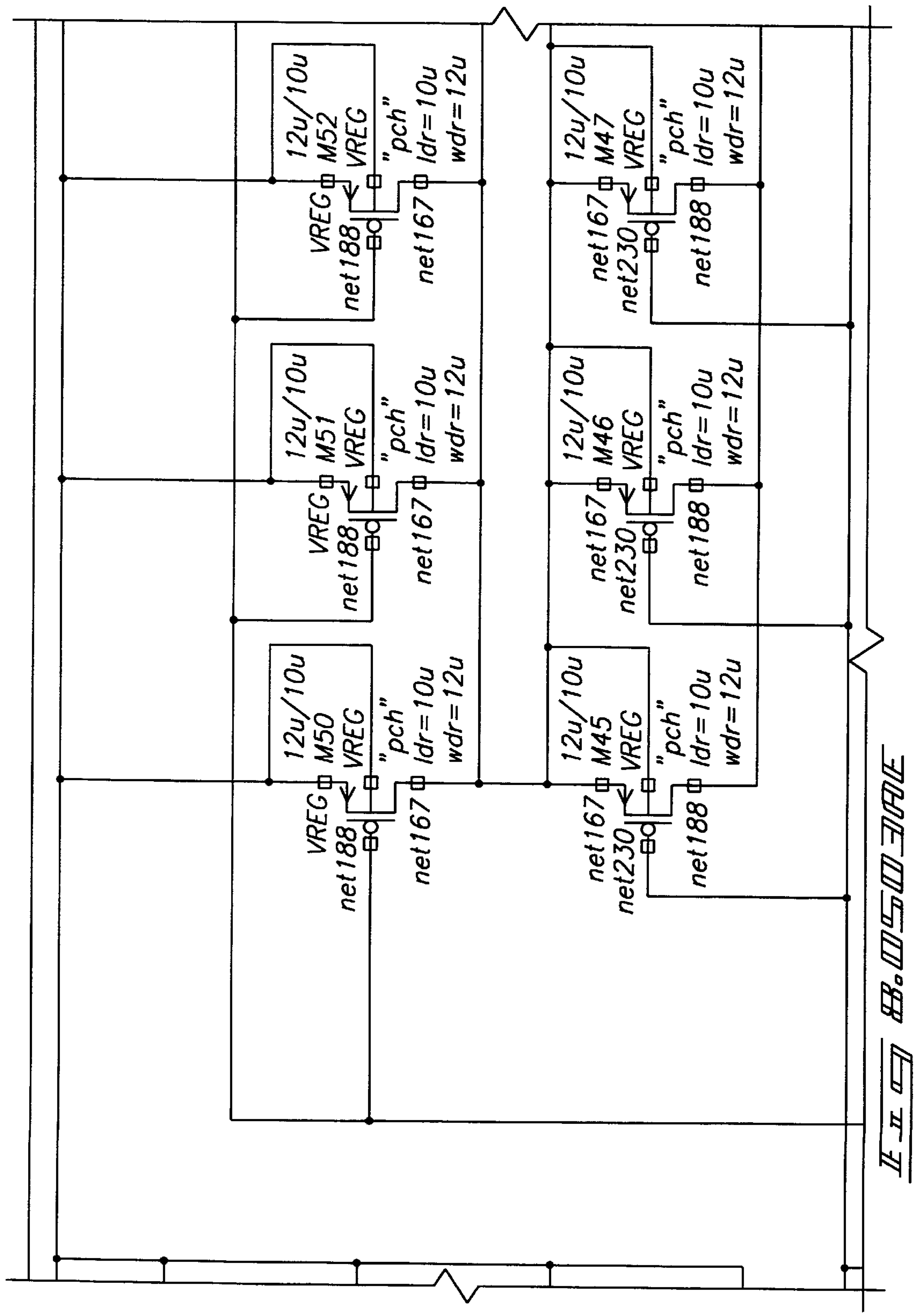
FIG. 8.050.3AE

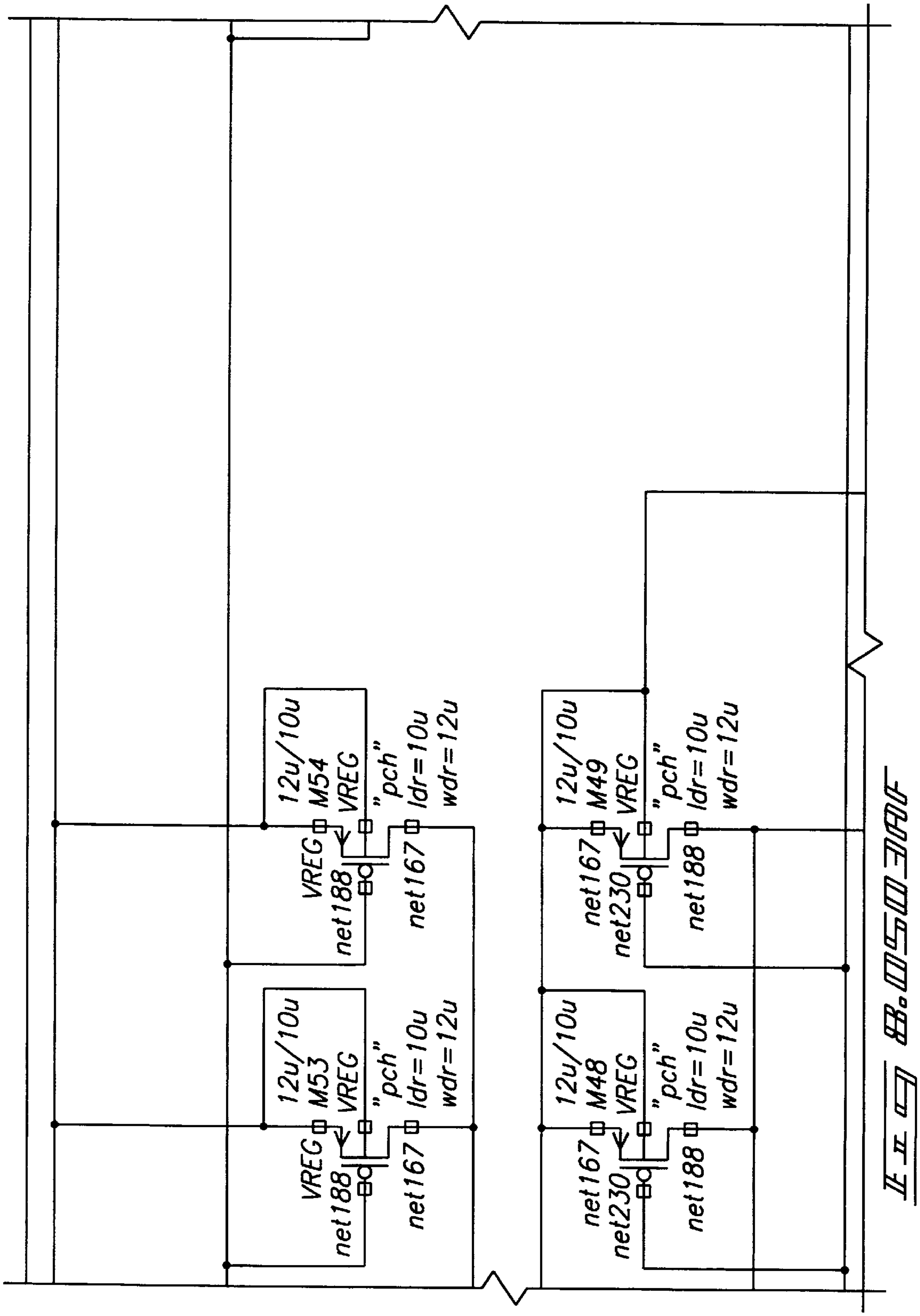
FIG. 8.050ЗAF

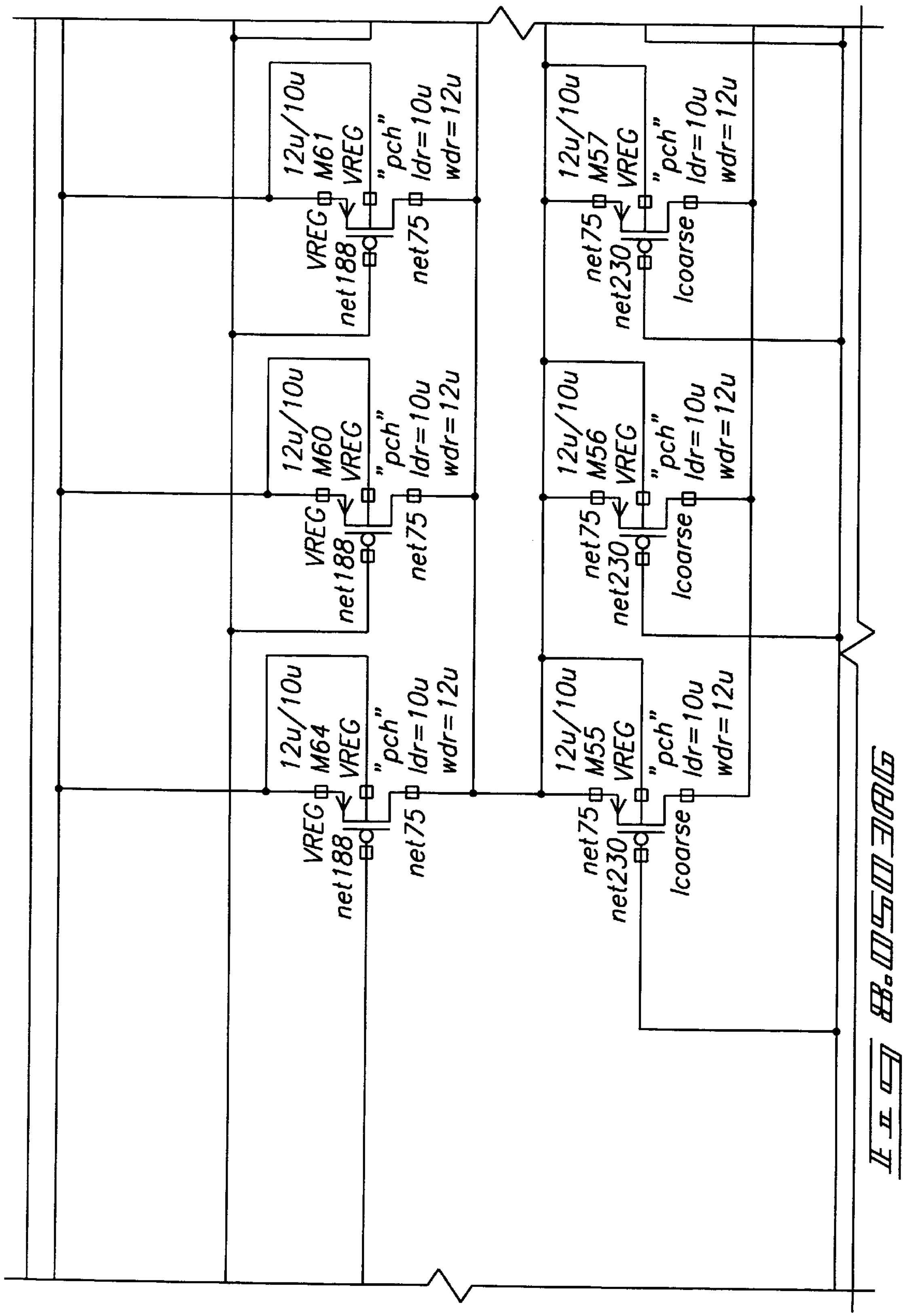
Fig. 8.050.3AG

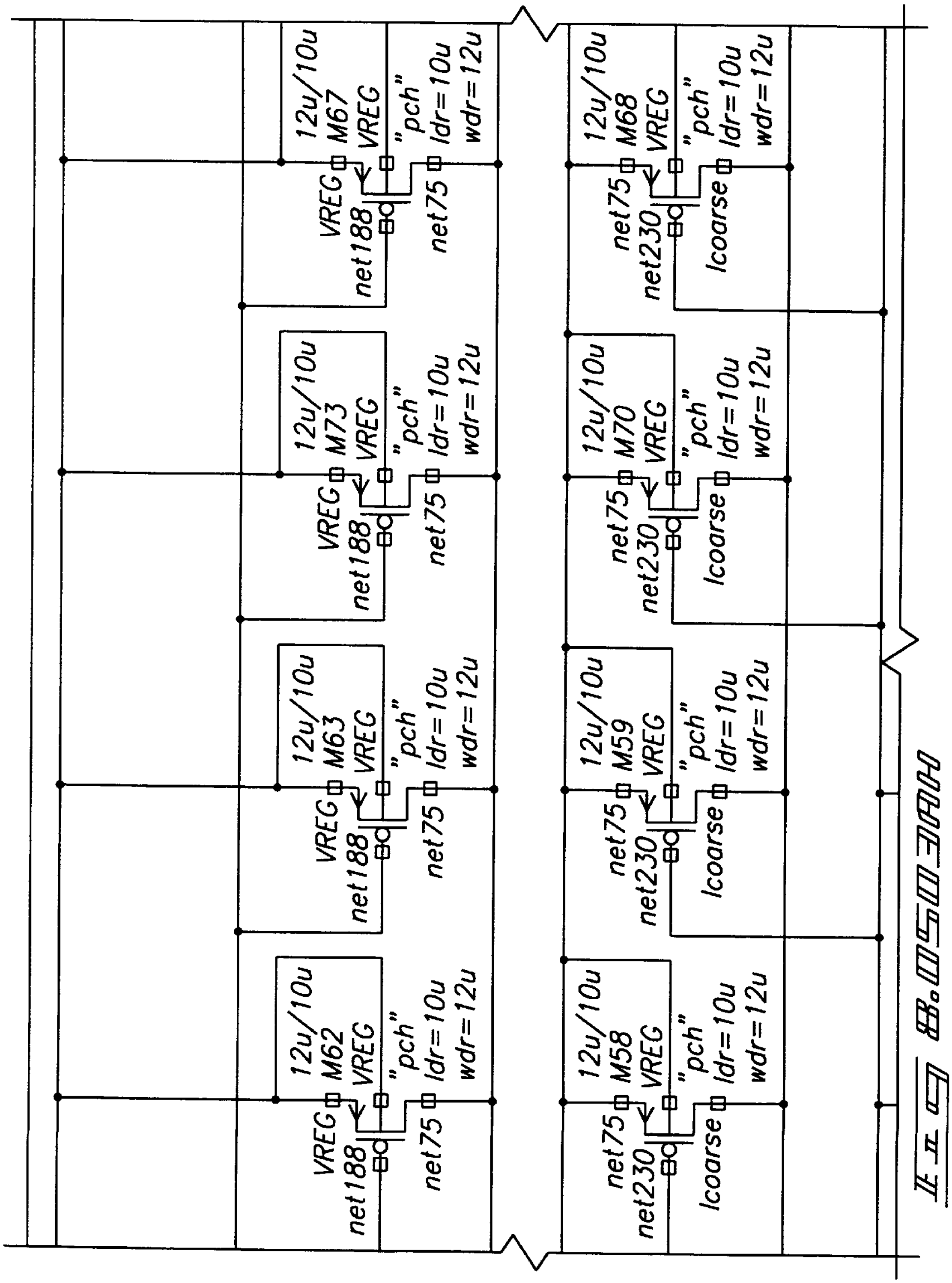
FIG. 8.0050FAAA

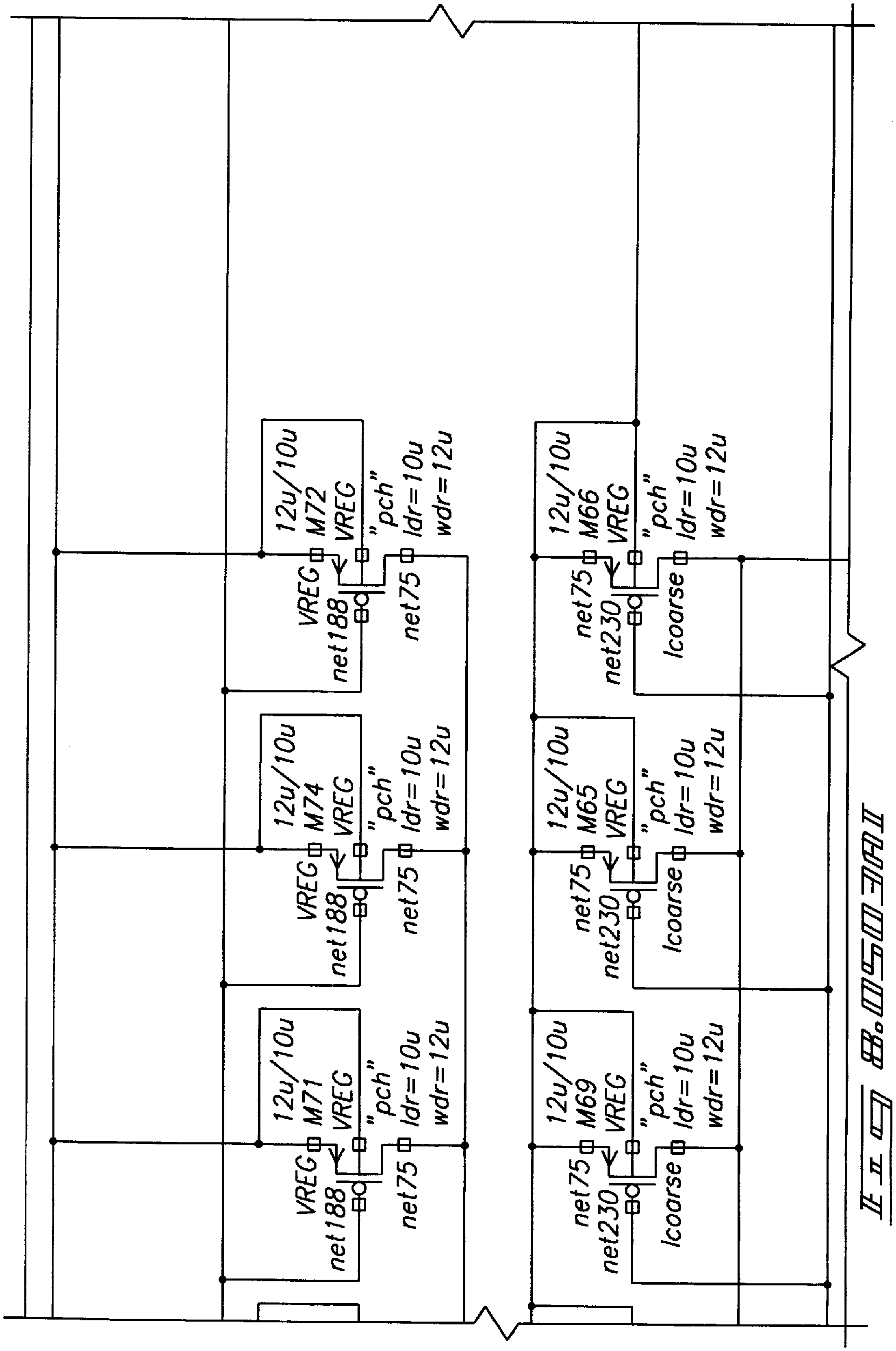
FIG. 8.050AI

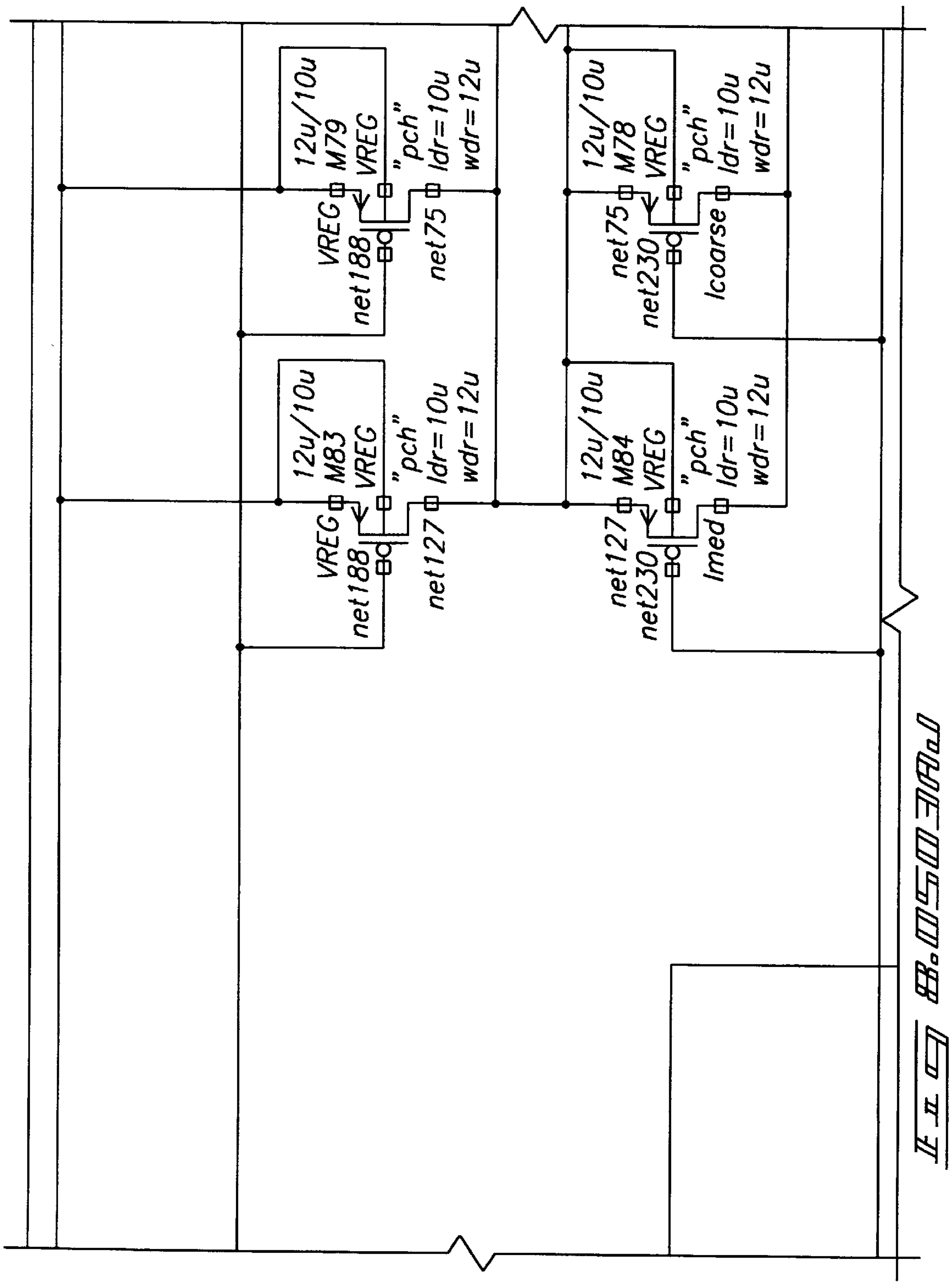
FIG. 8.0503AJ

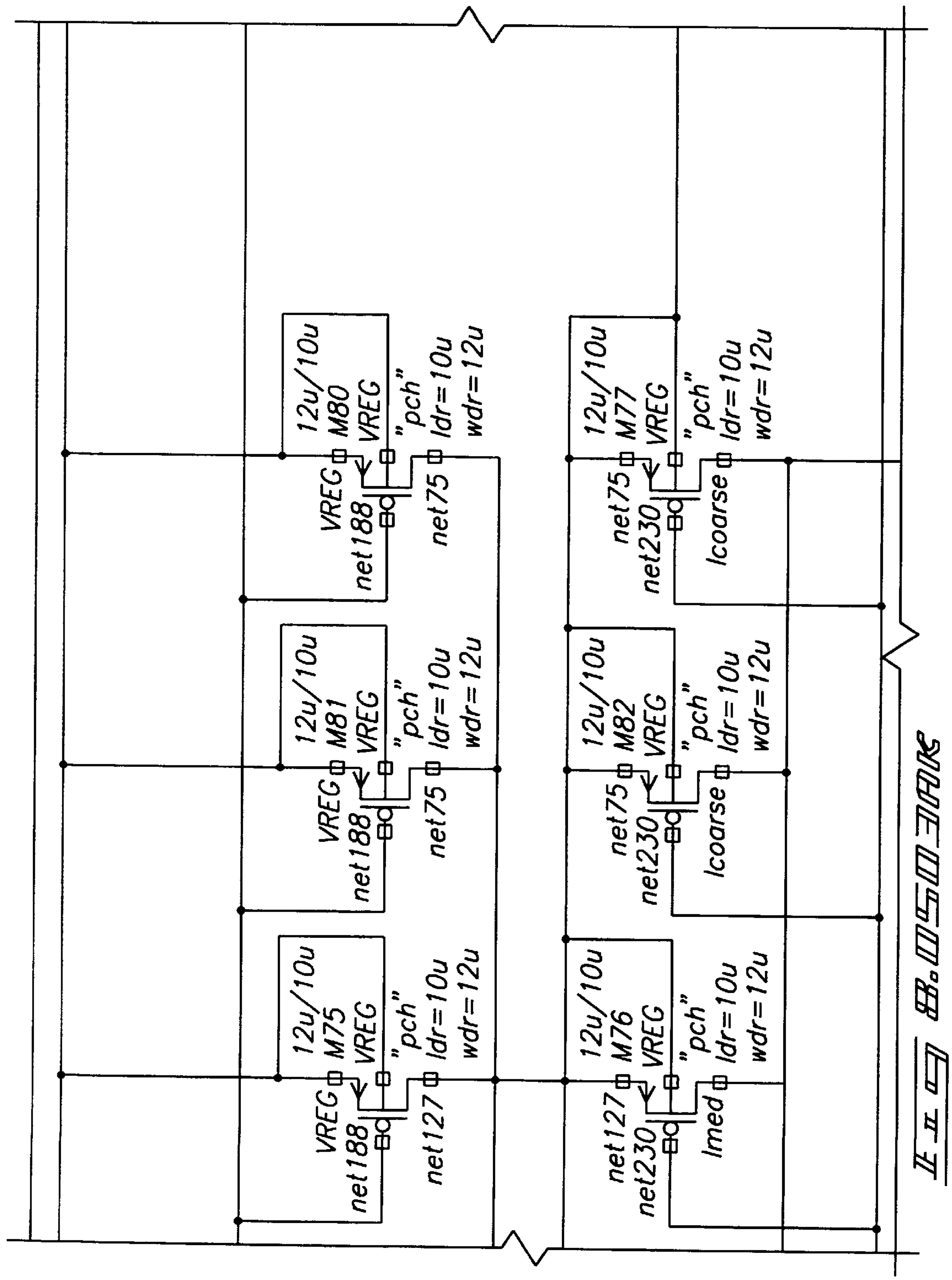
FIG. 8.005EAK

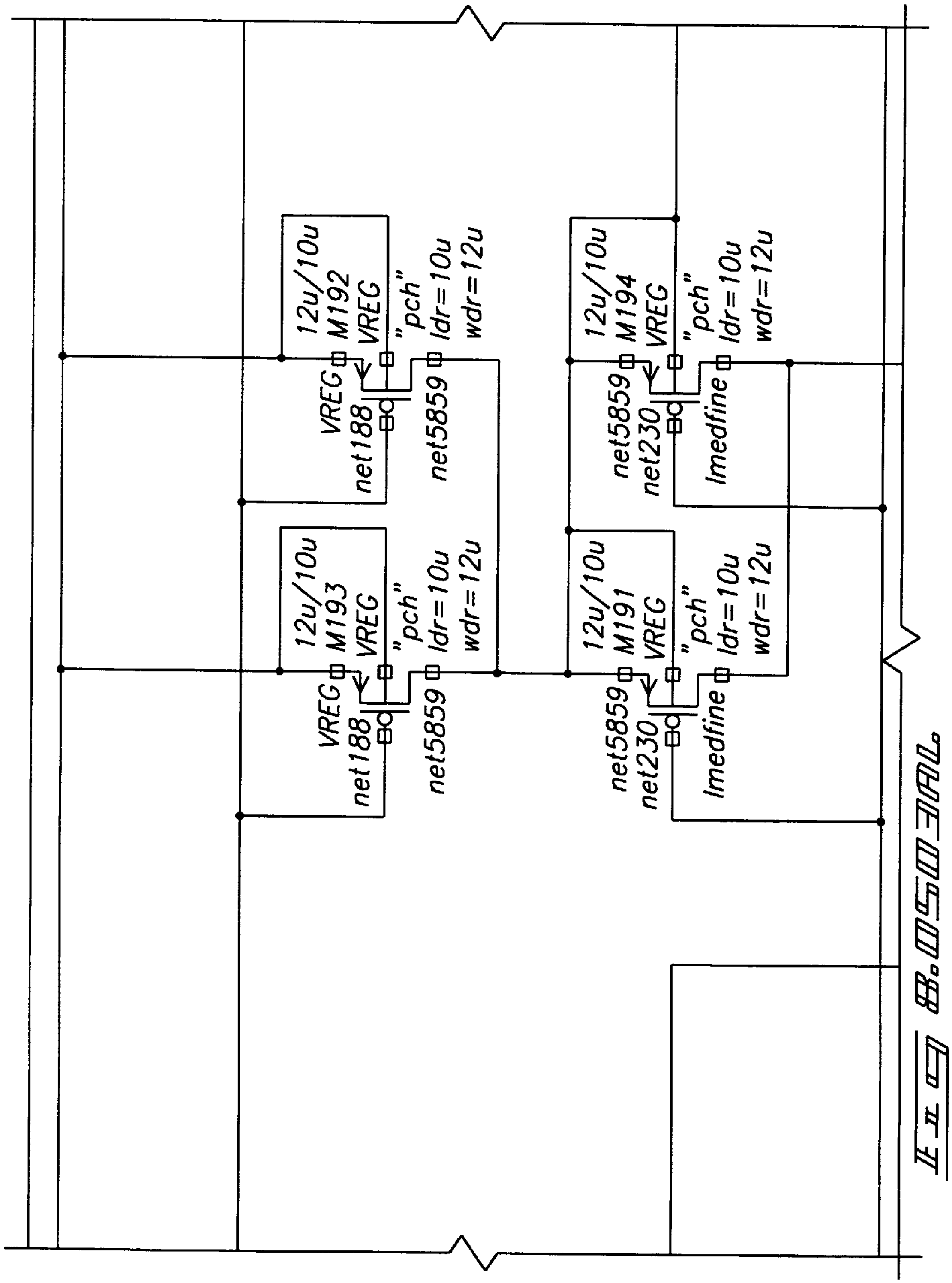
FIG. 8.050JAL

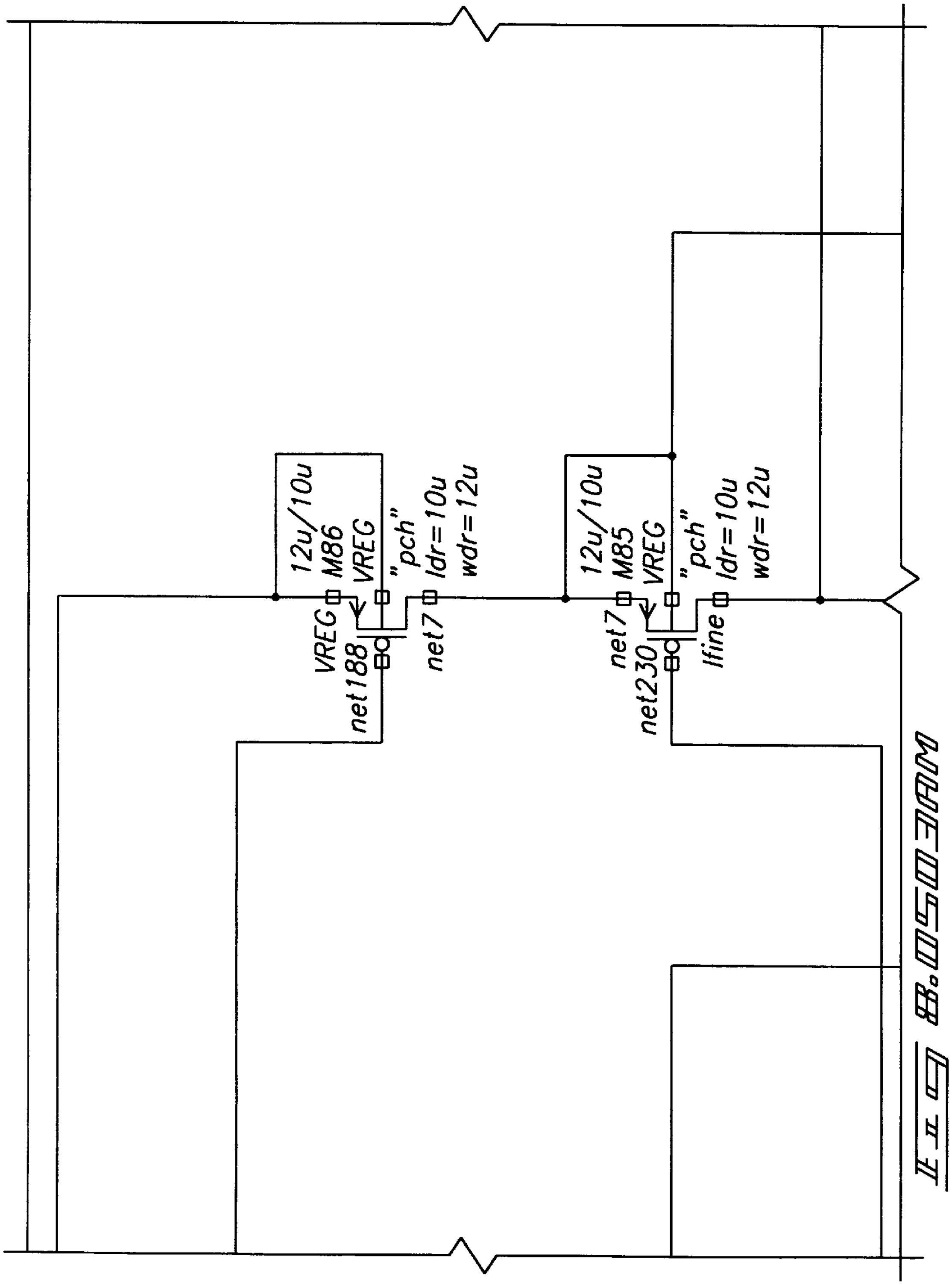
FIG. 8.0050EAM

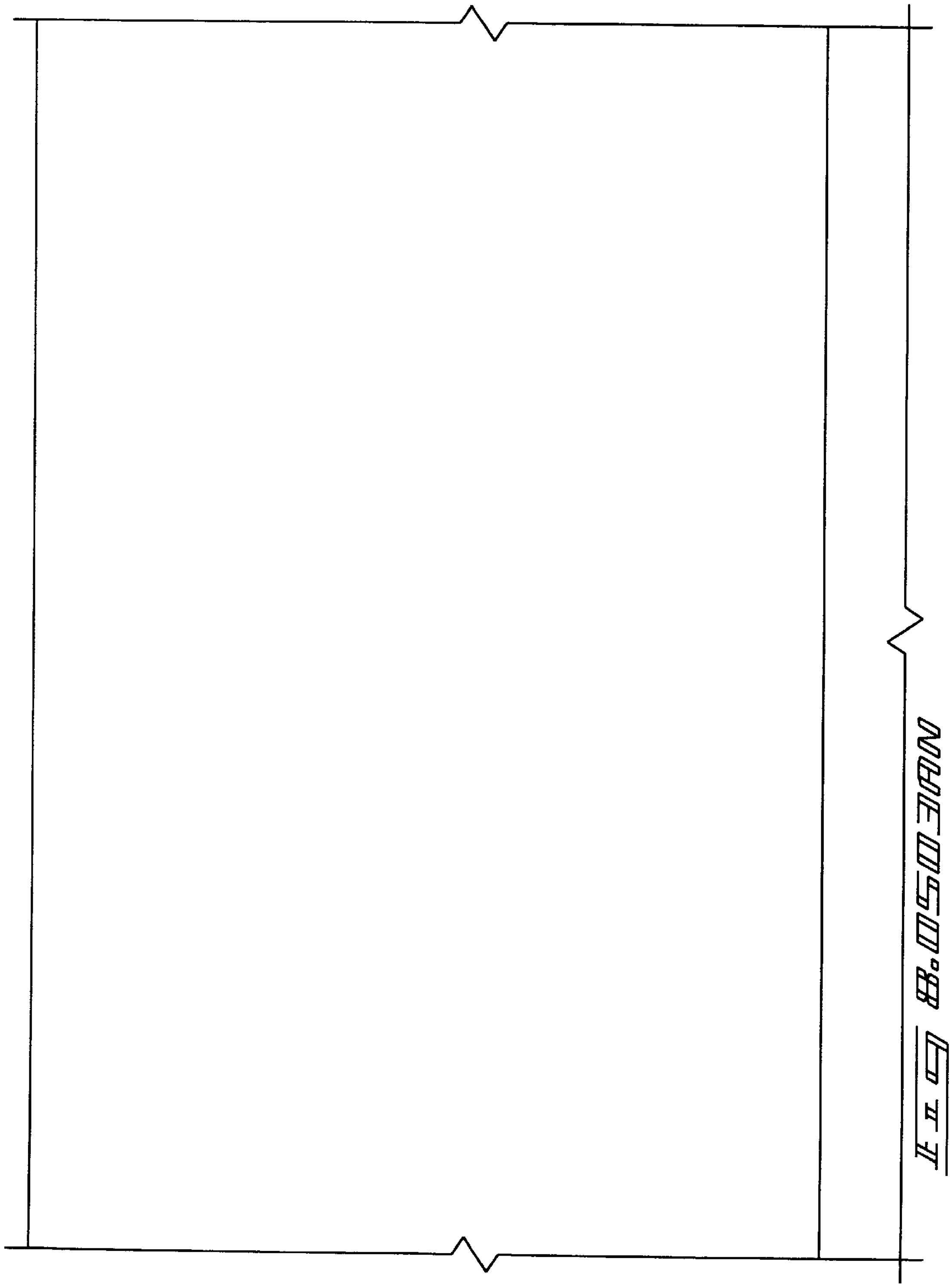
Fig. 8.0503AN

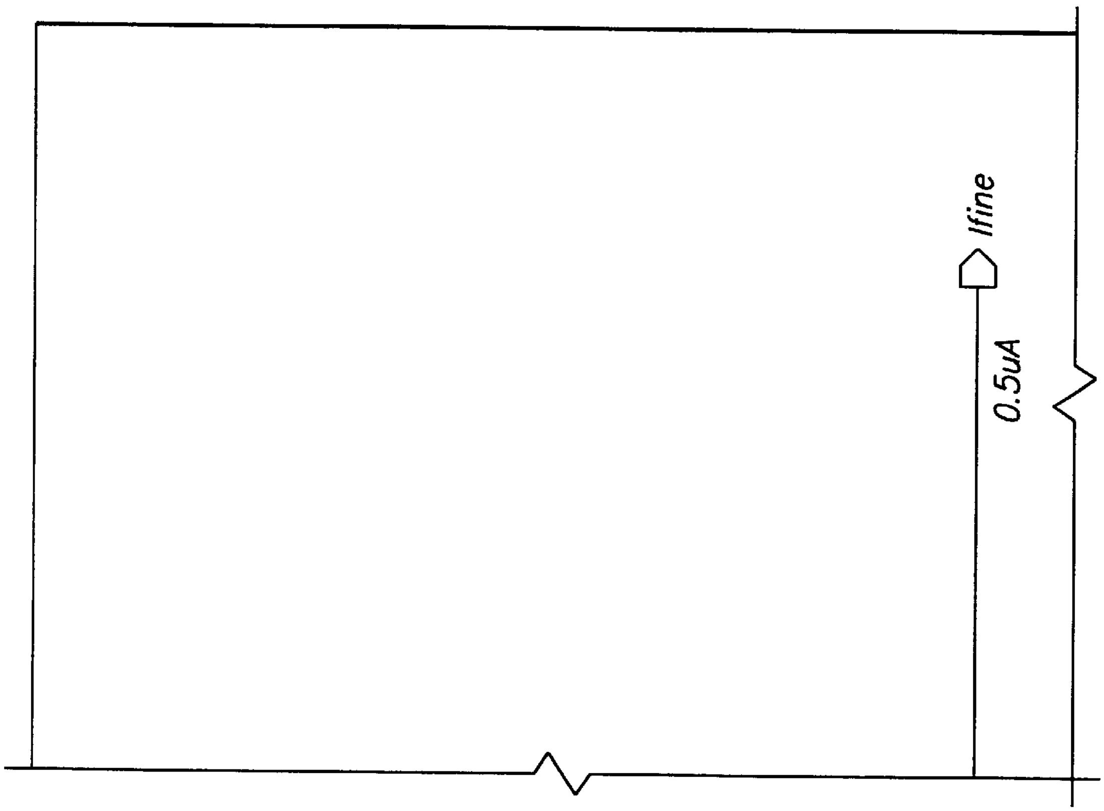
Fig 8.050EAD

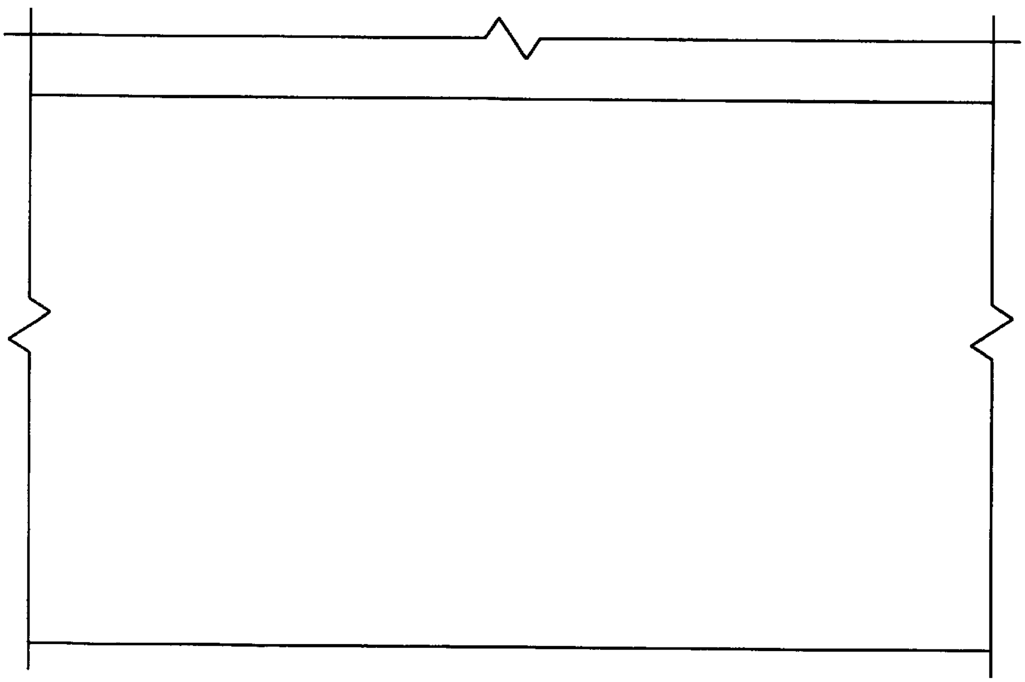
Fig. 8.0503BH

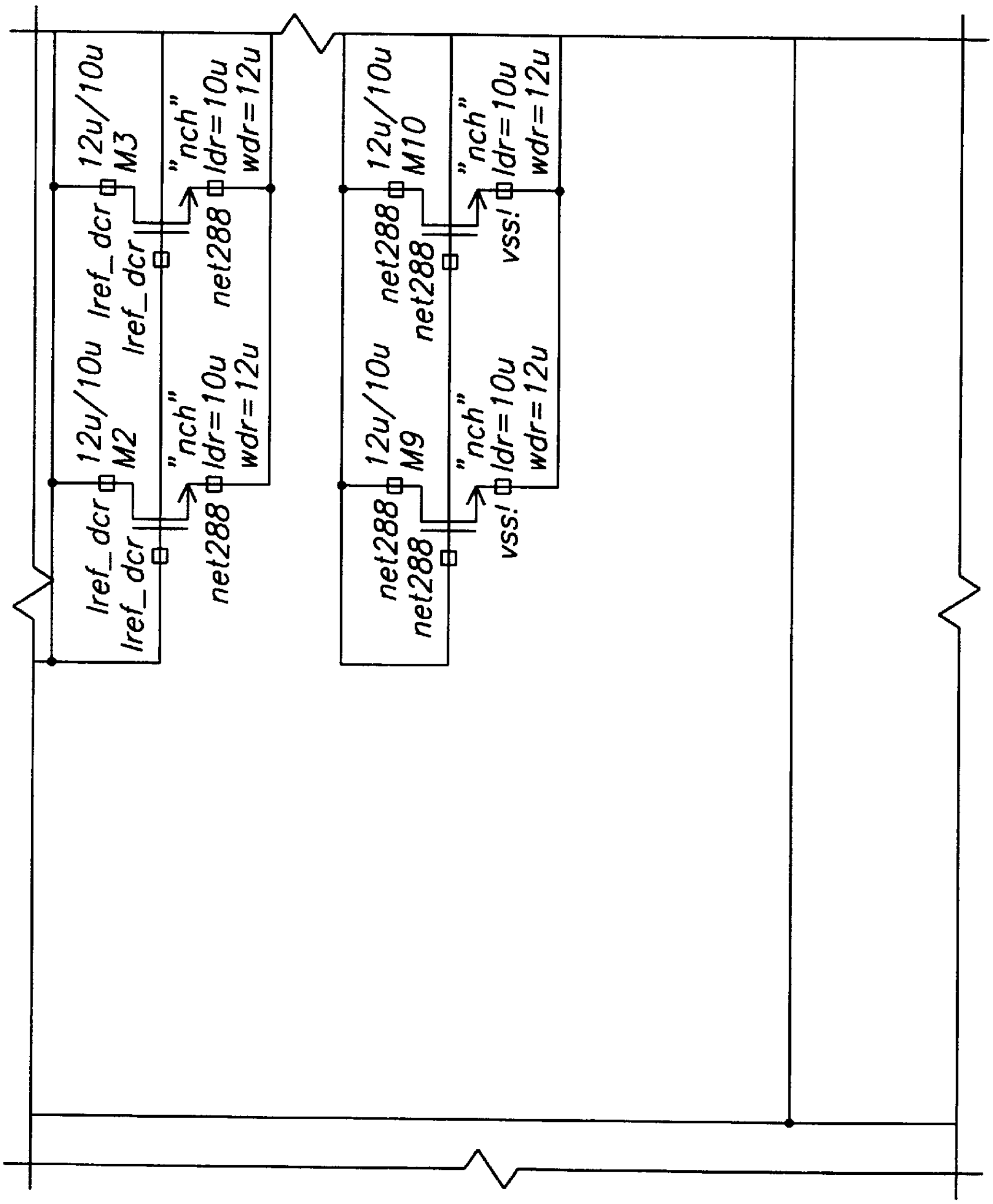
FIG. 8.050.3BB

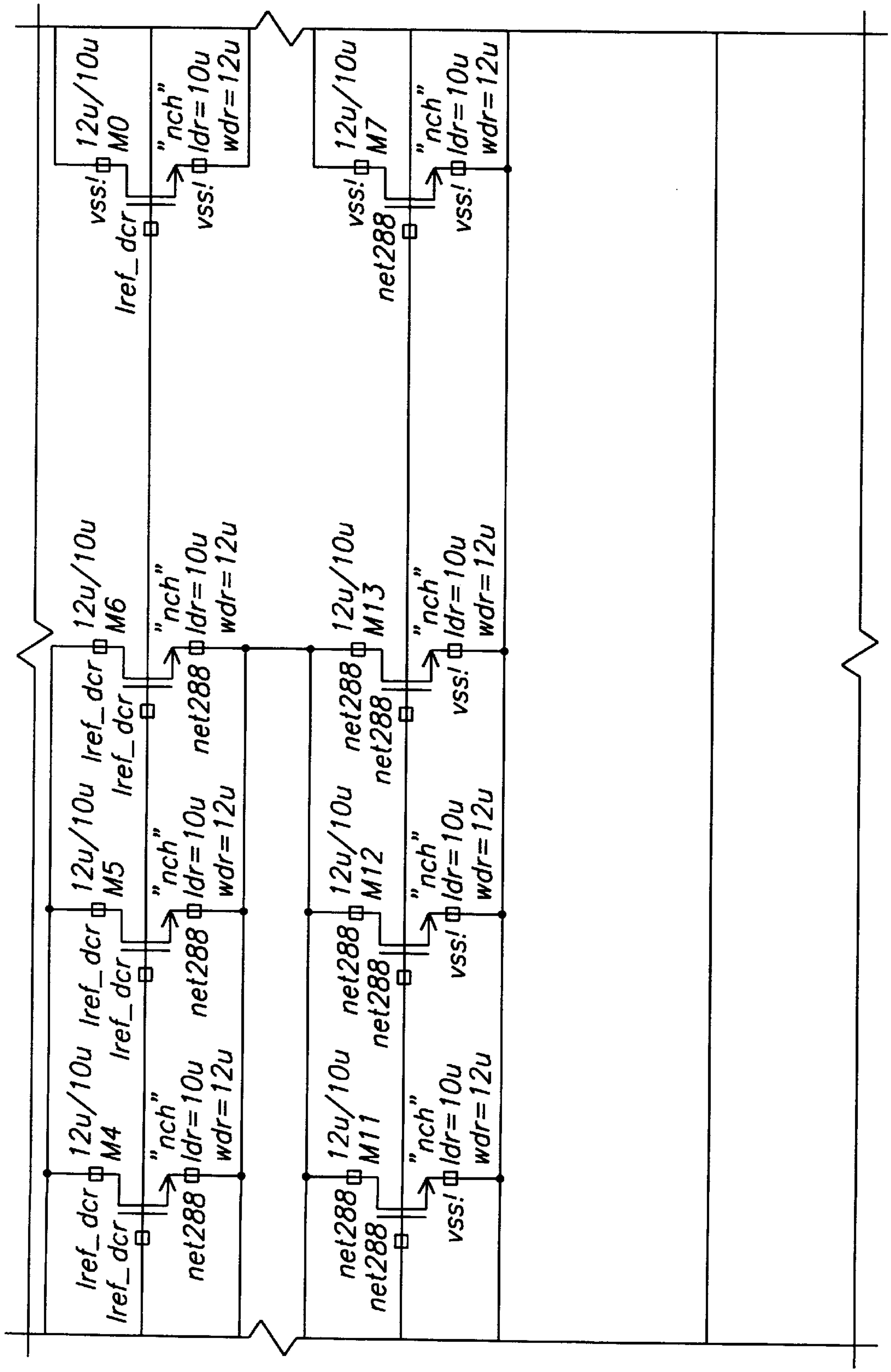
FIG. 8.050.3BC

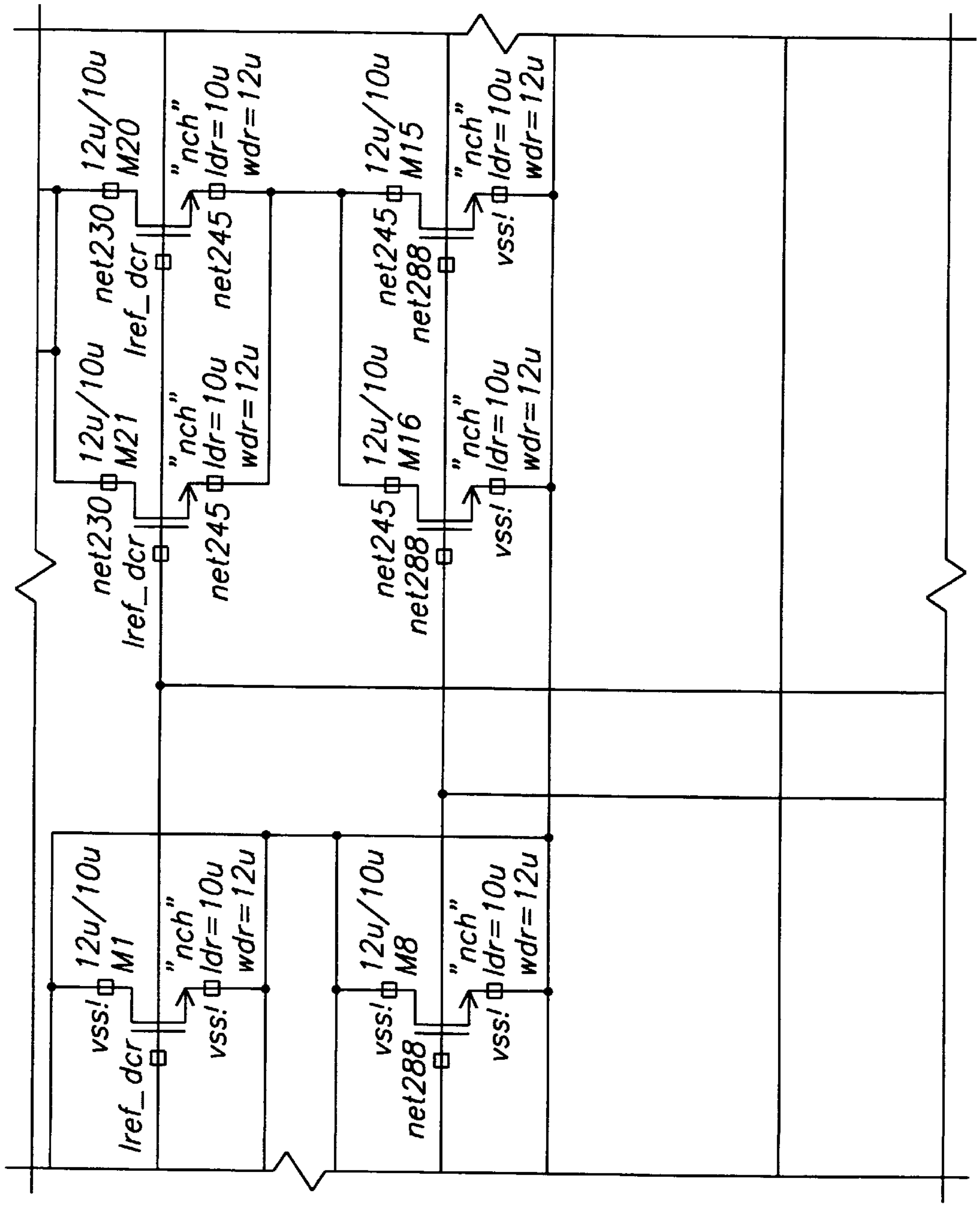
FIG. 8.0503BD

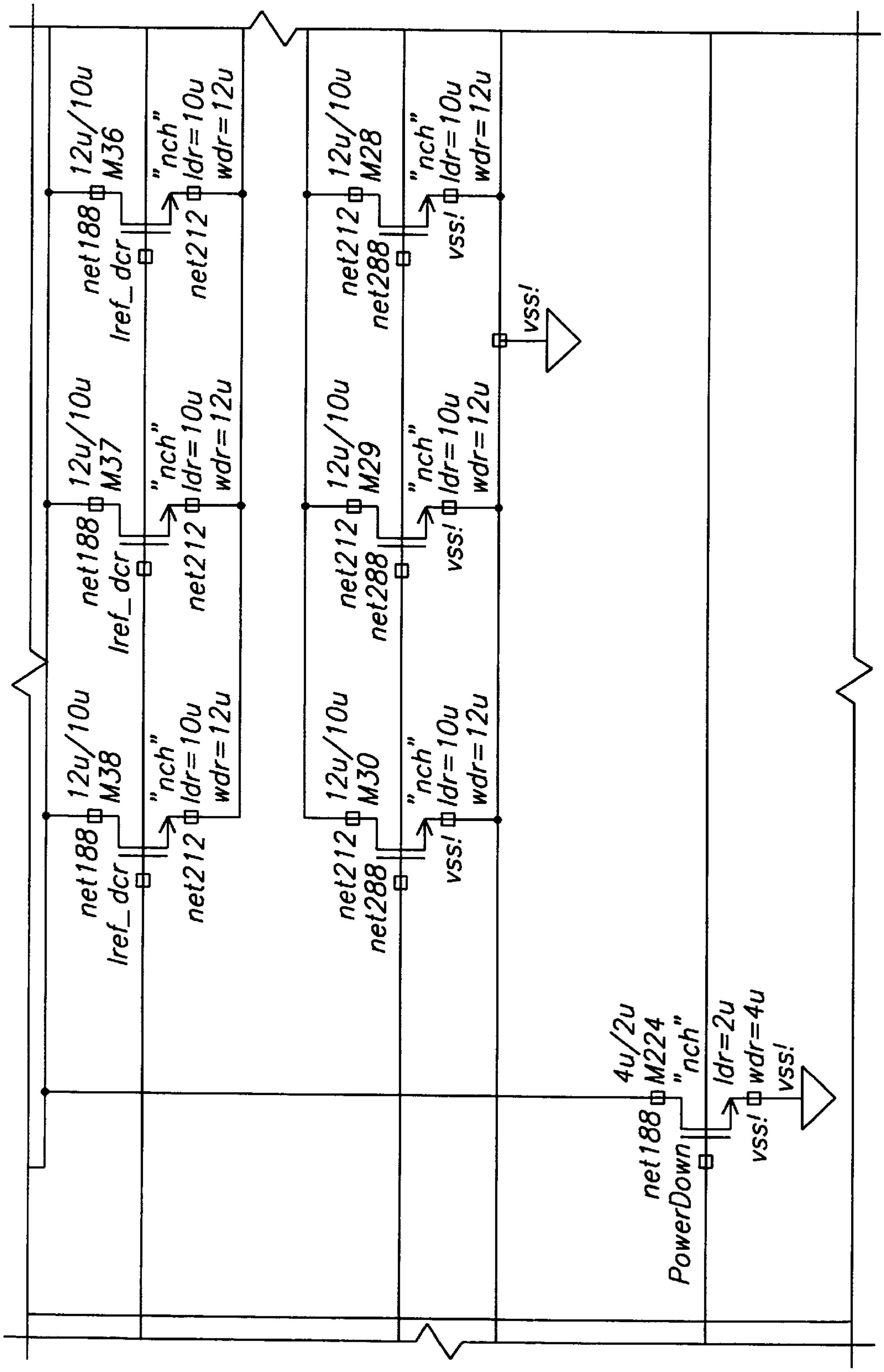
FIG. 8.0503BE

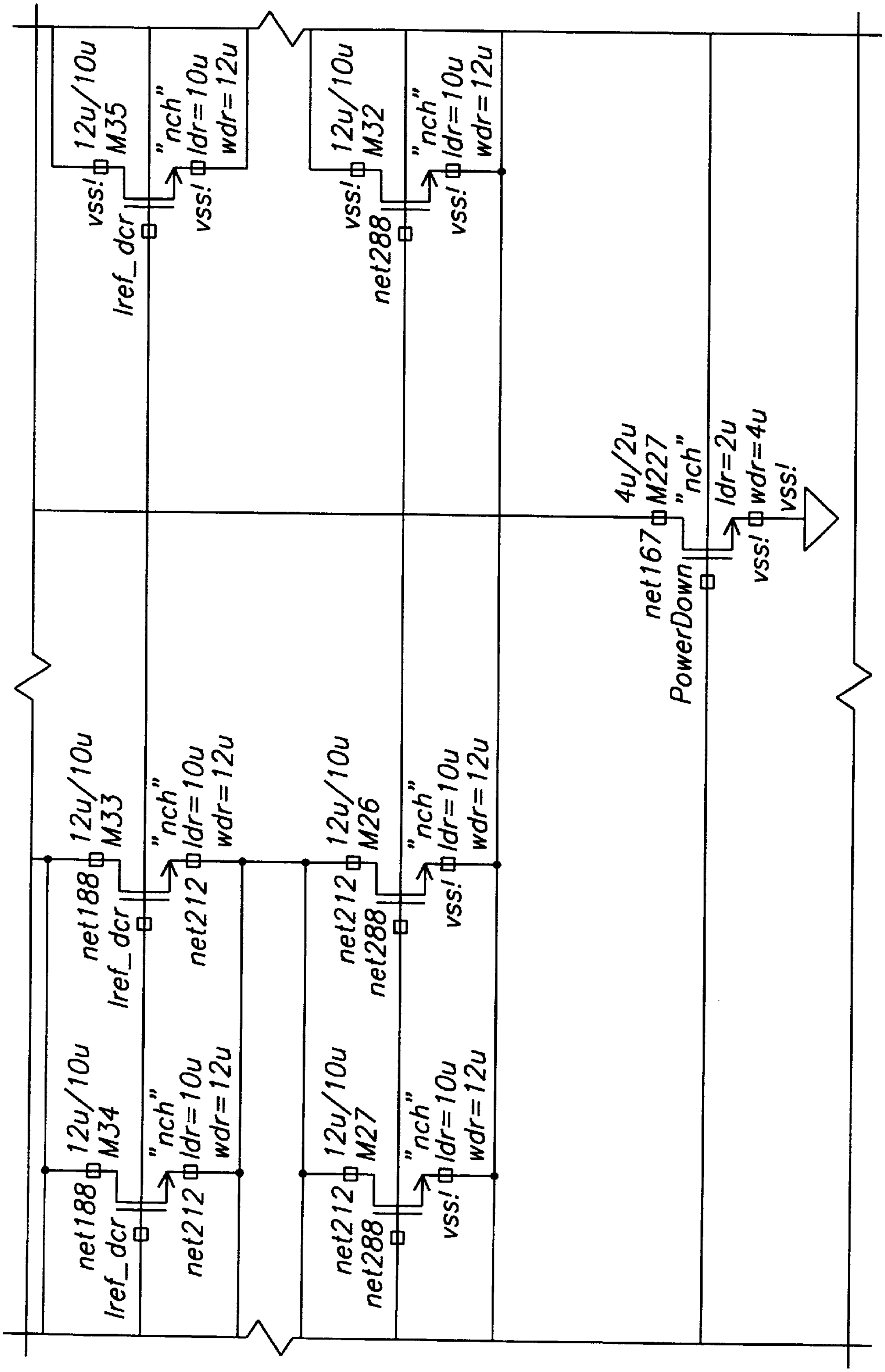
FIG. 8.0503BF

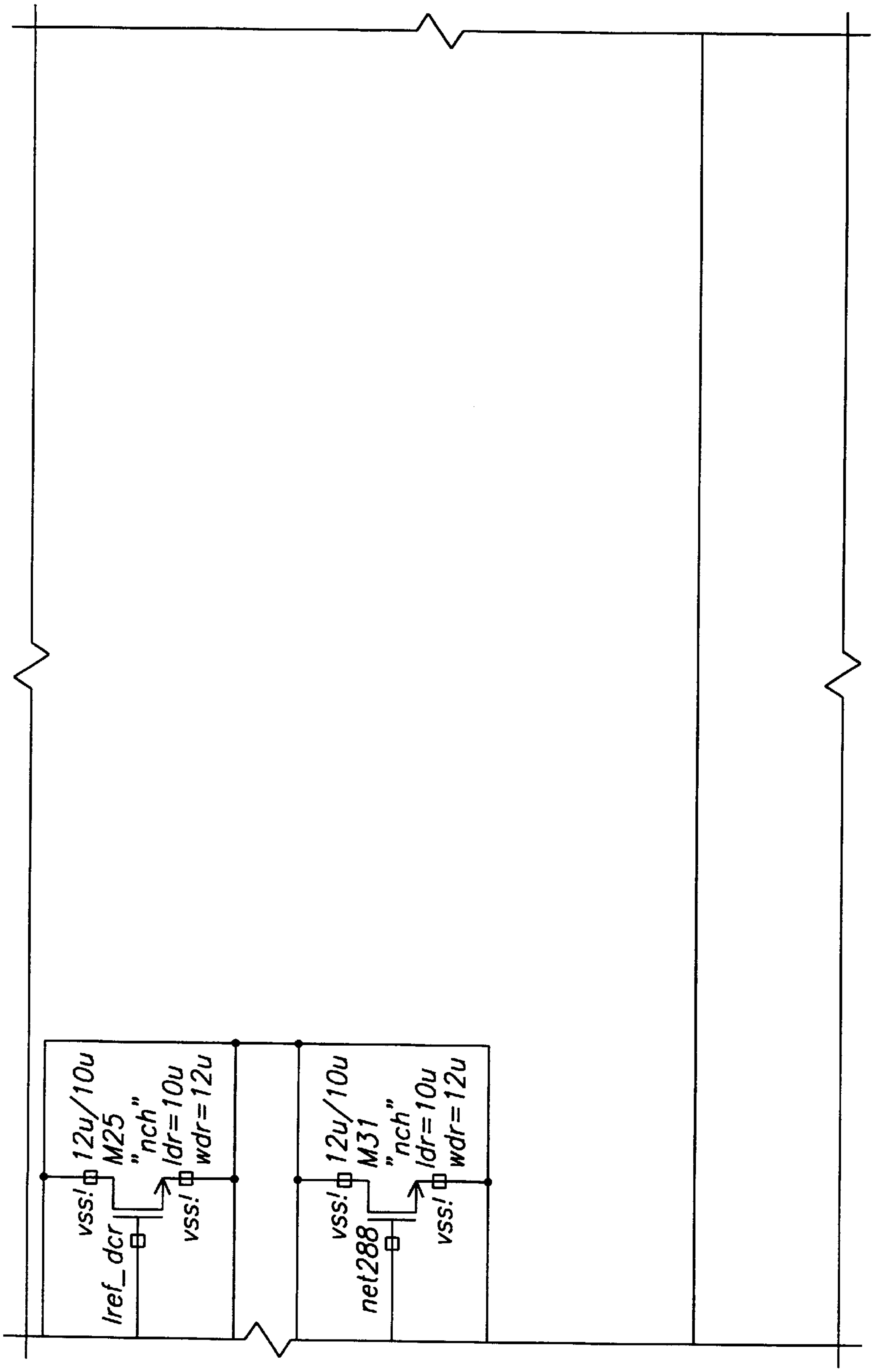
FIG. 8.050.3BG

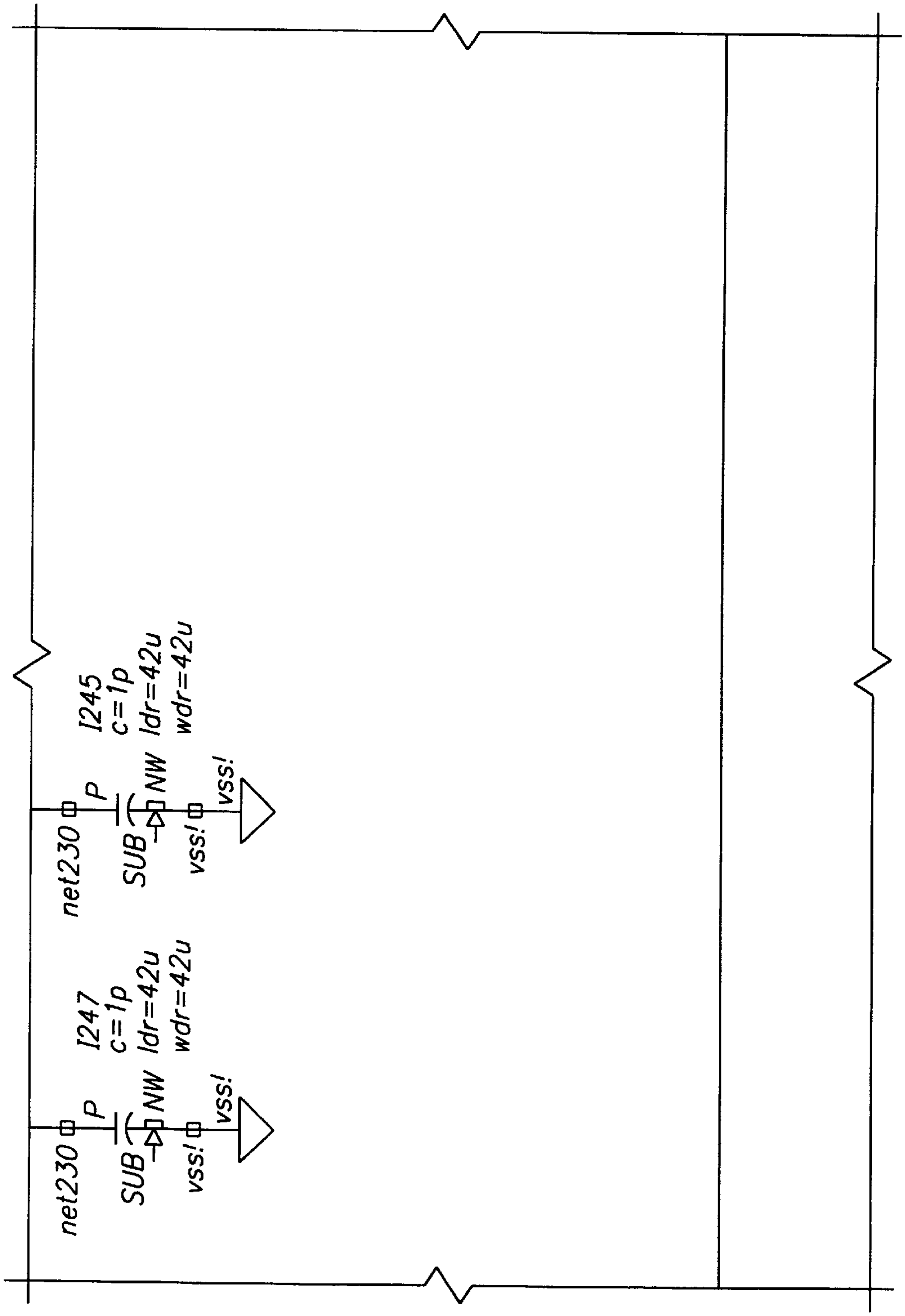
Fig. 8.050EAH

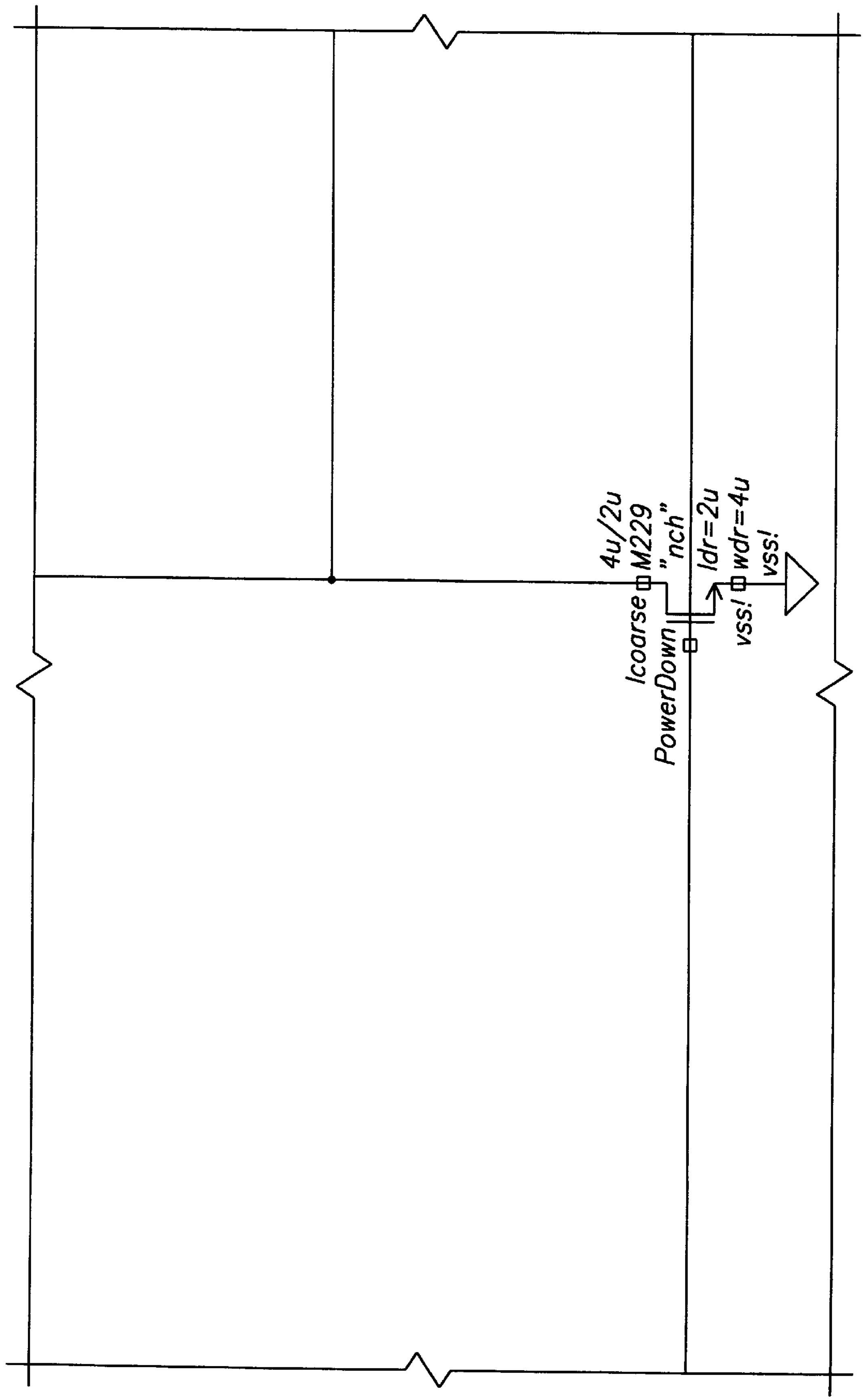
FIG. 8.050.3BII

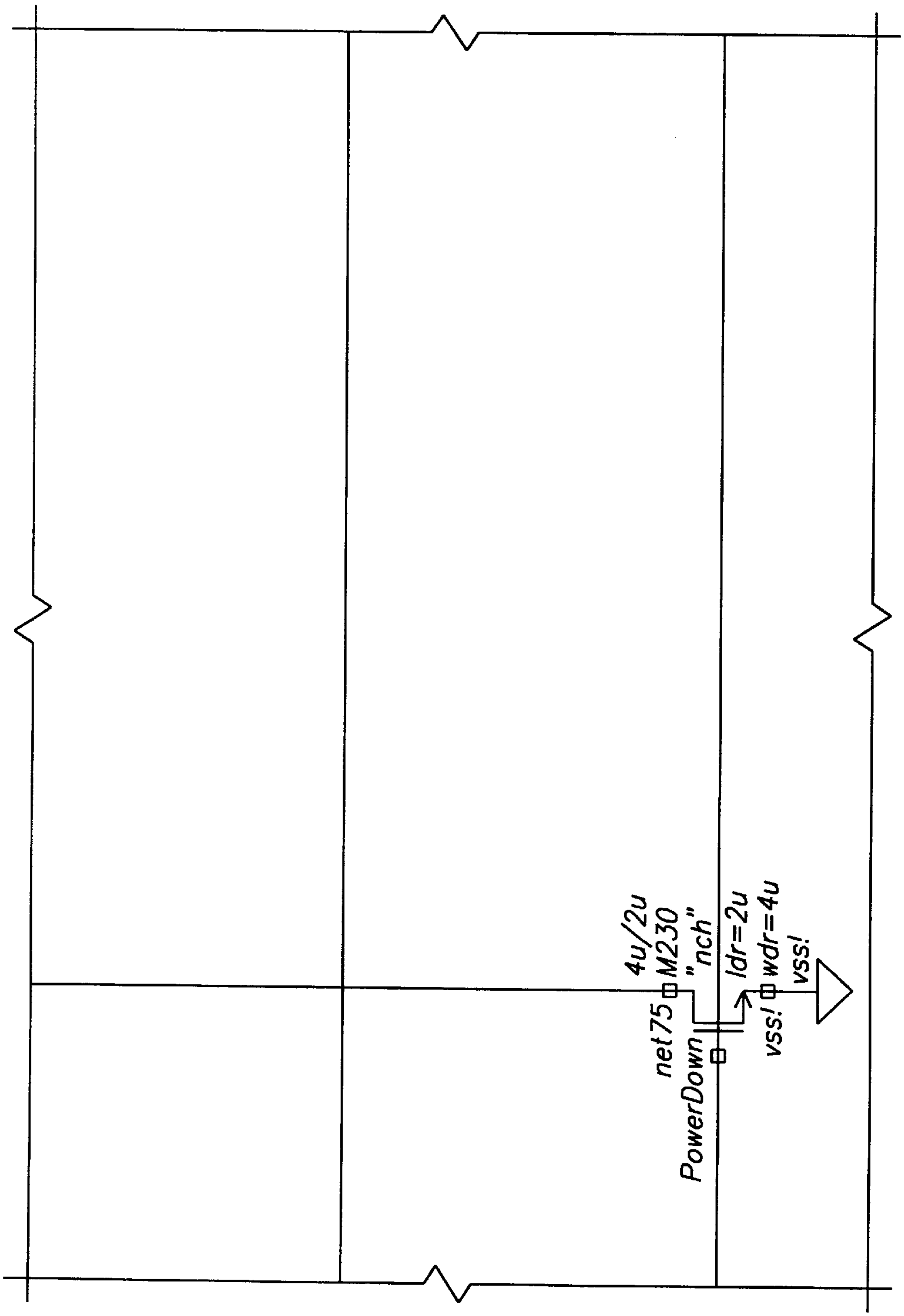
FIG. 8.050.3B.J

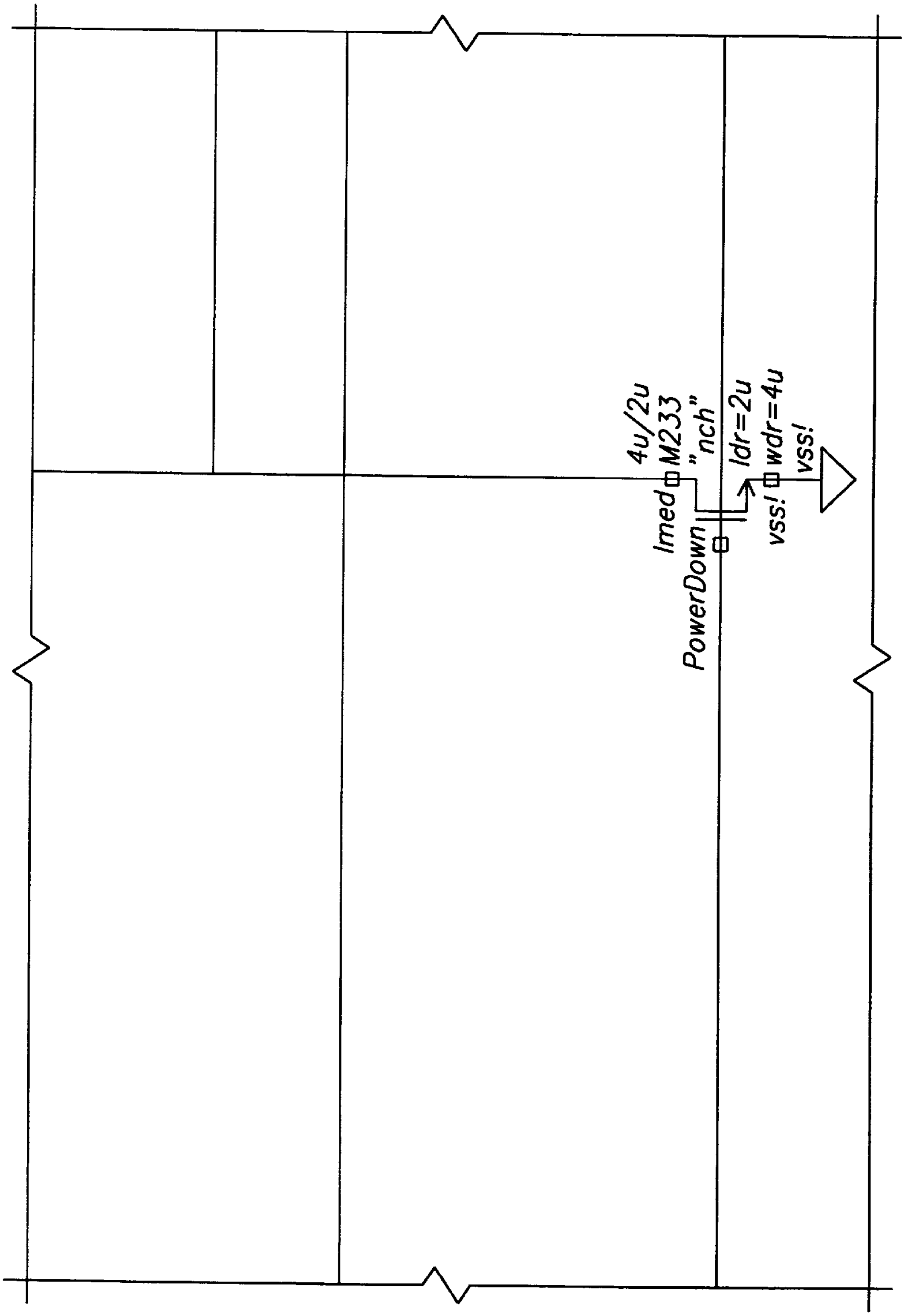
FIG. 8.050.3BK

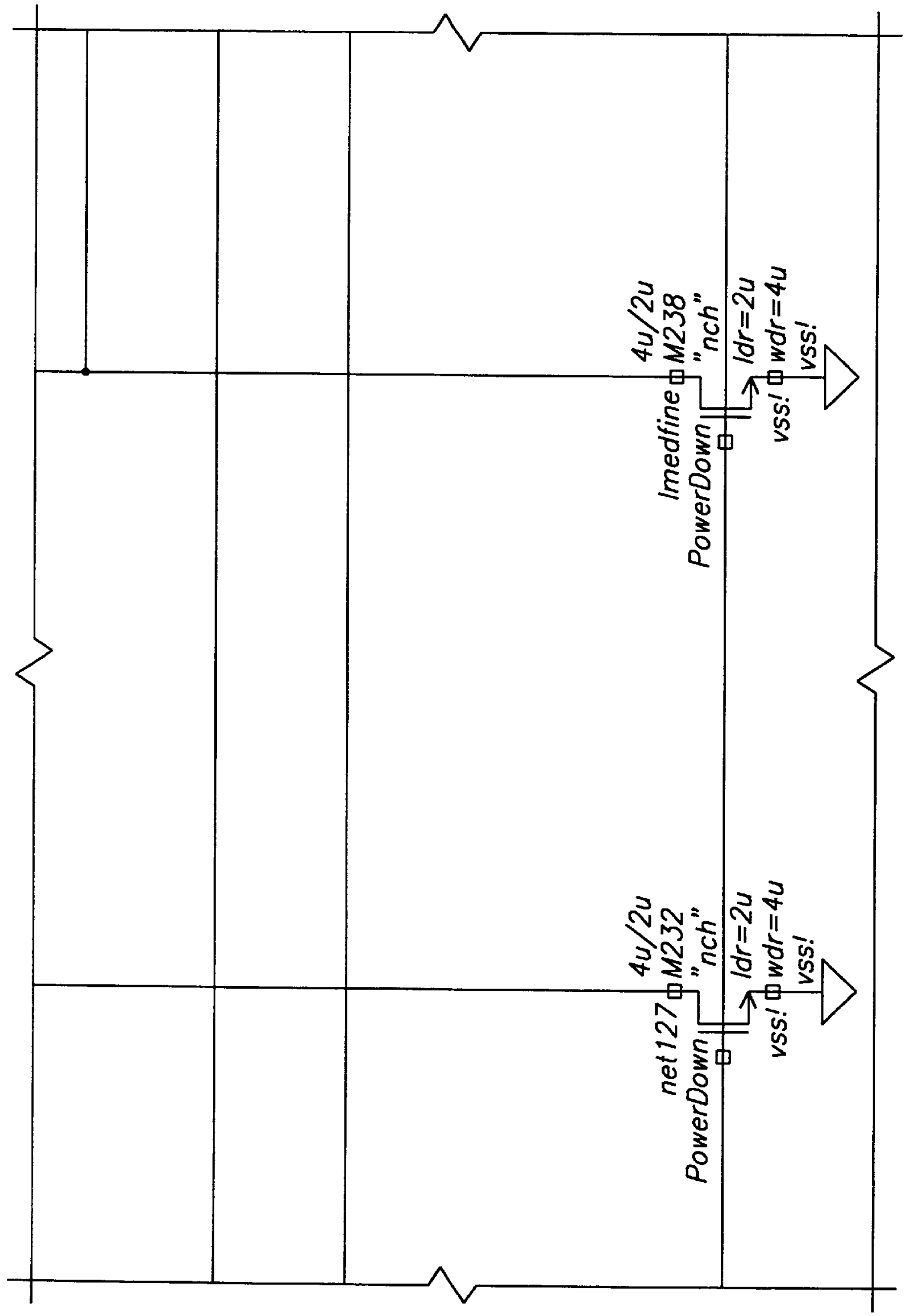
FIG. 8.05038L

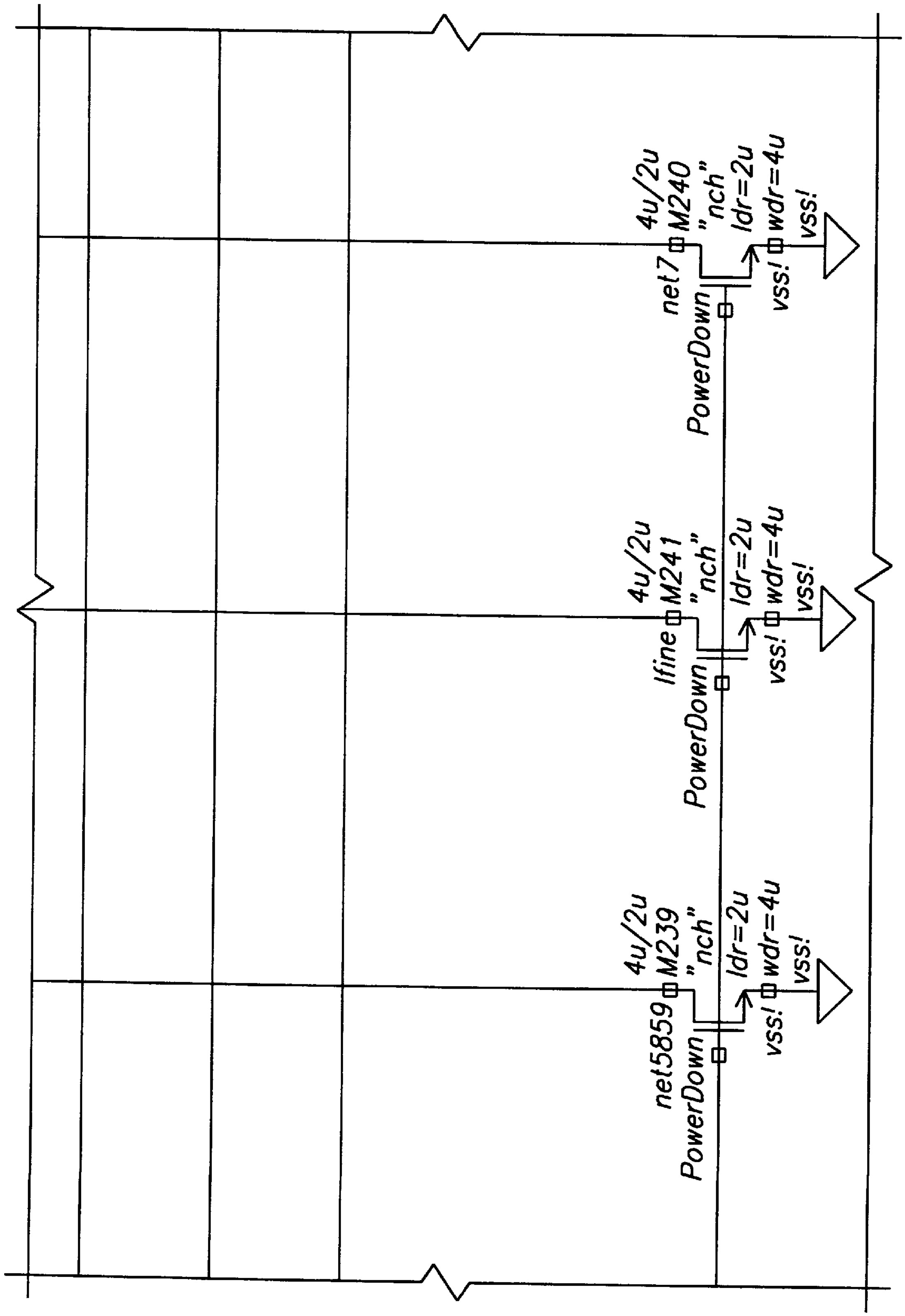
FIG. 8.050 3BM

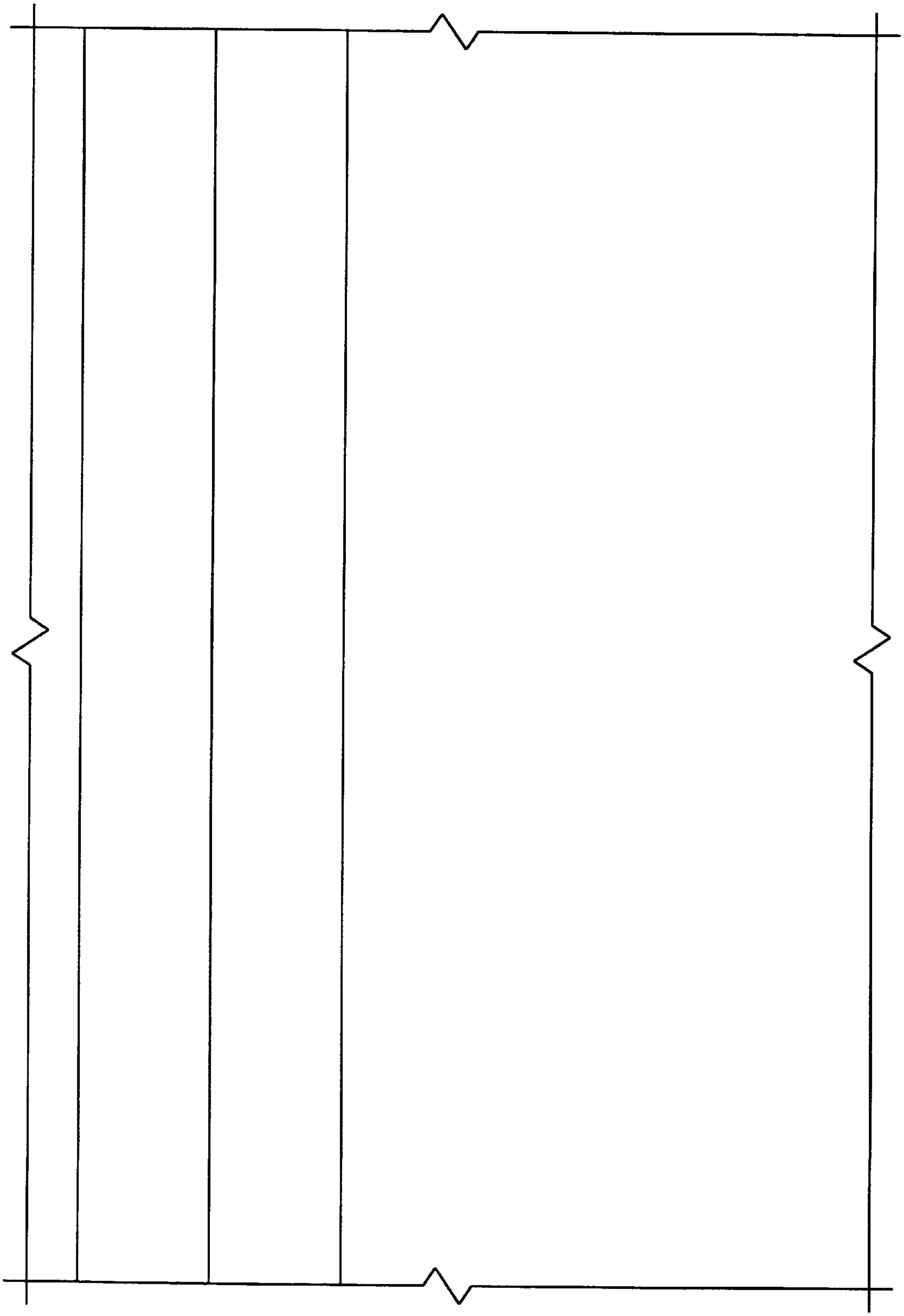
FIG. 8.050E3N

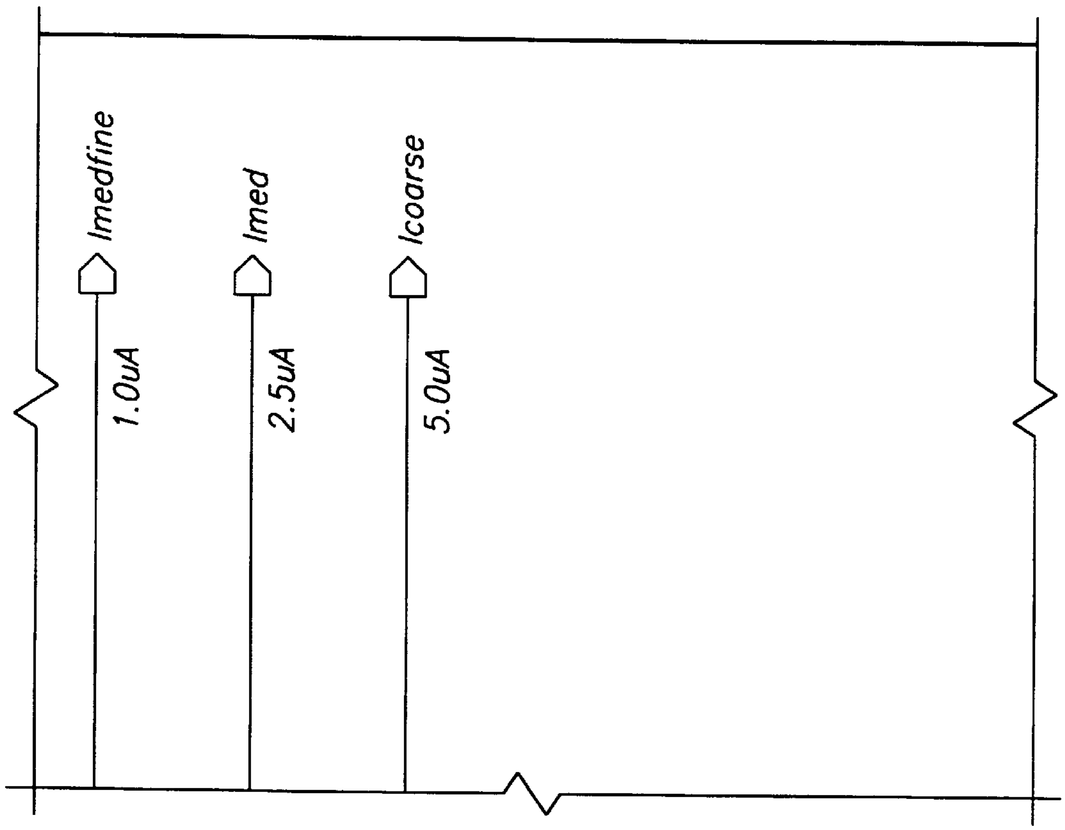
Fig. 8.0503B0

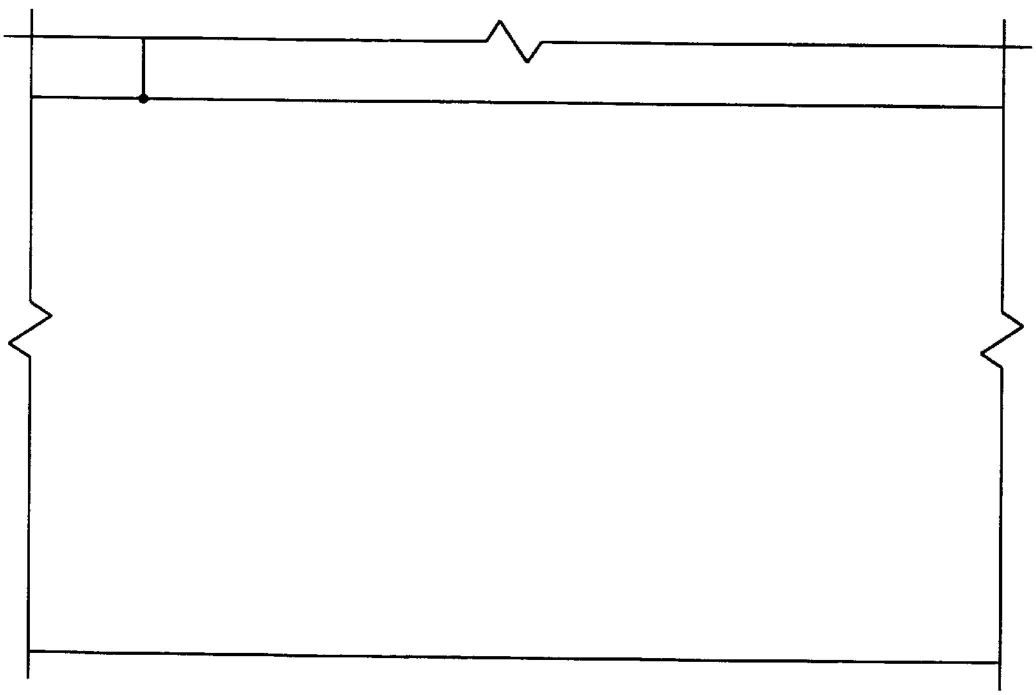
FIG. 8.0503CA

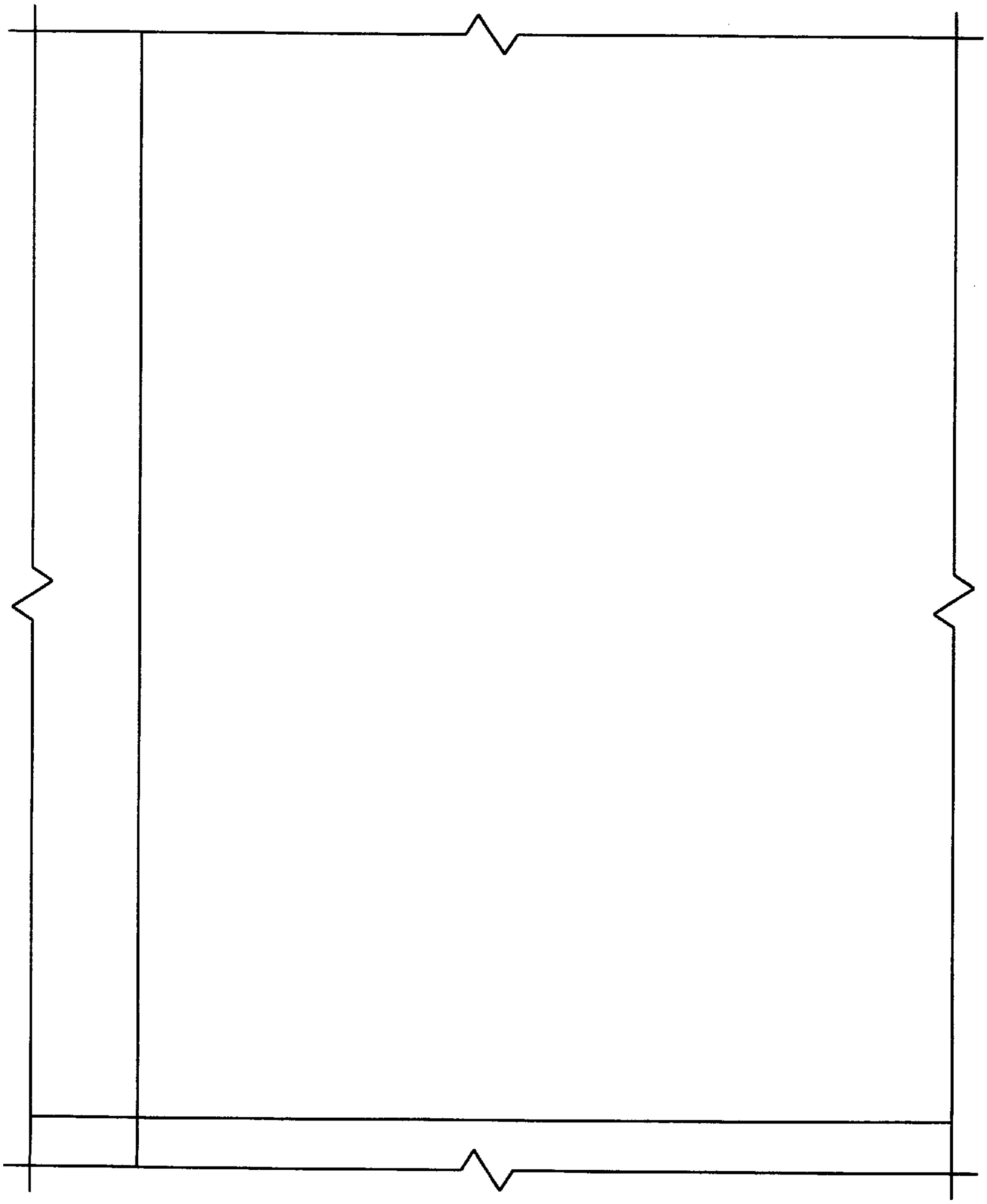
Fig. 8.0503CB

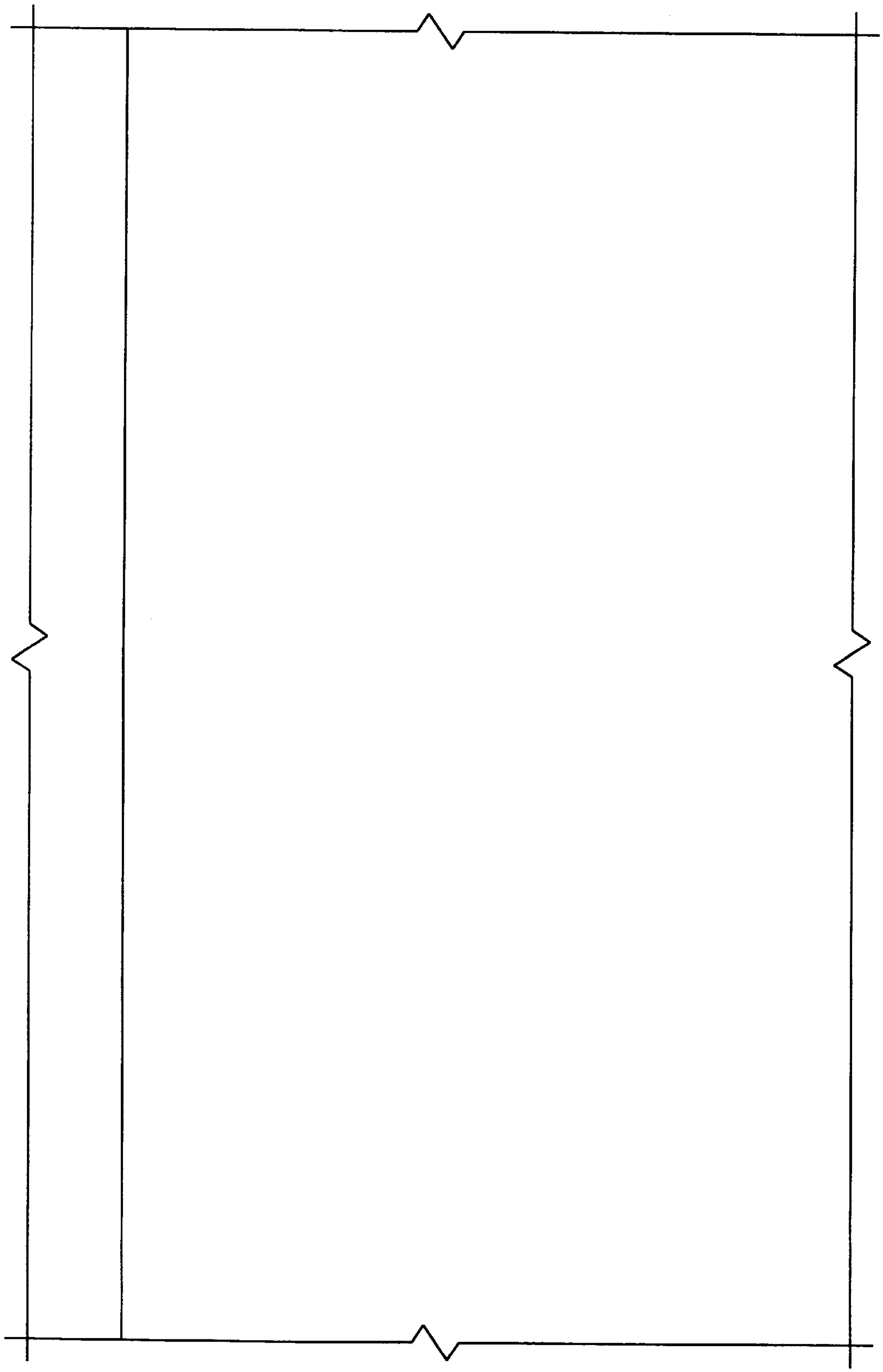
FIG. 8.0503CC

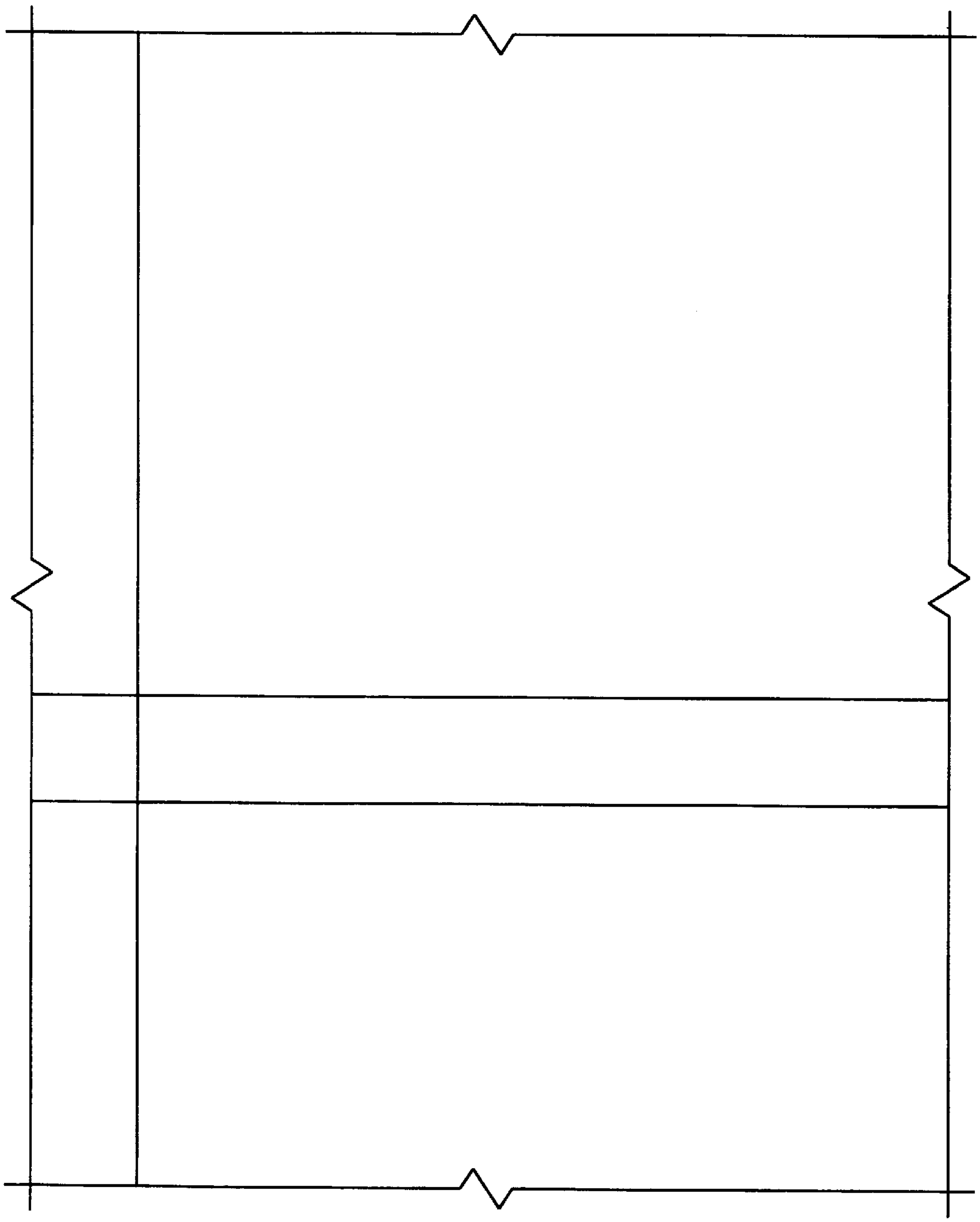
FIG. 8.0503CD

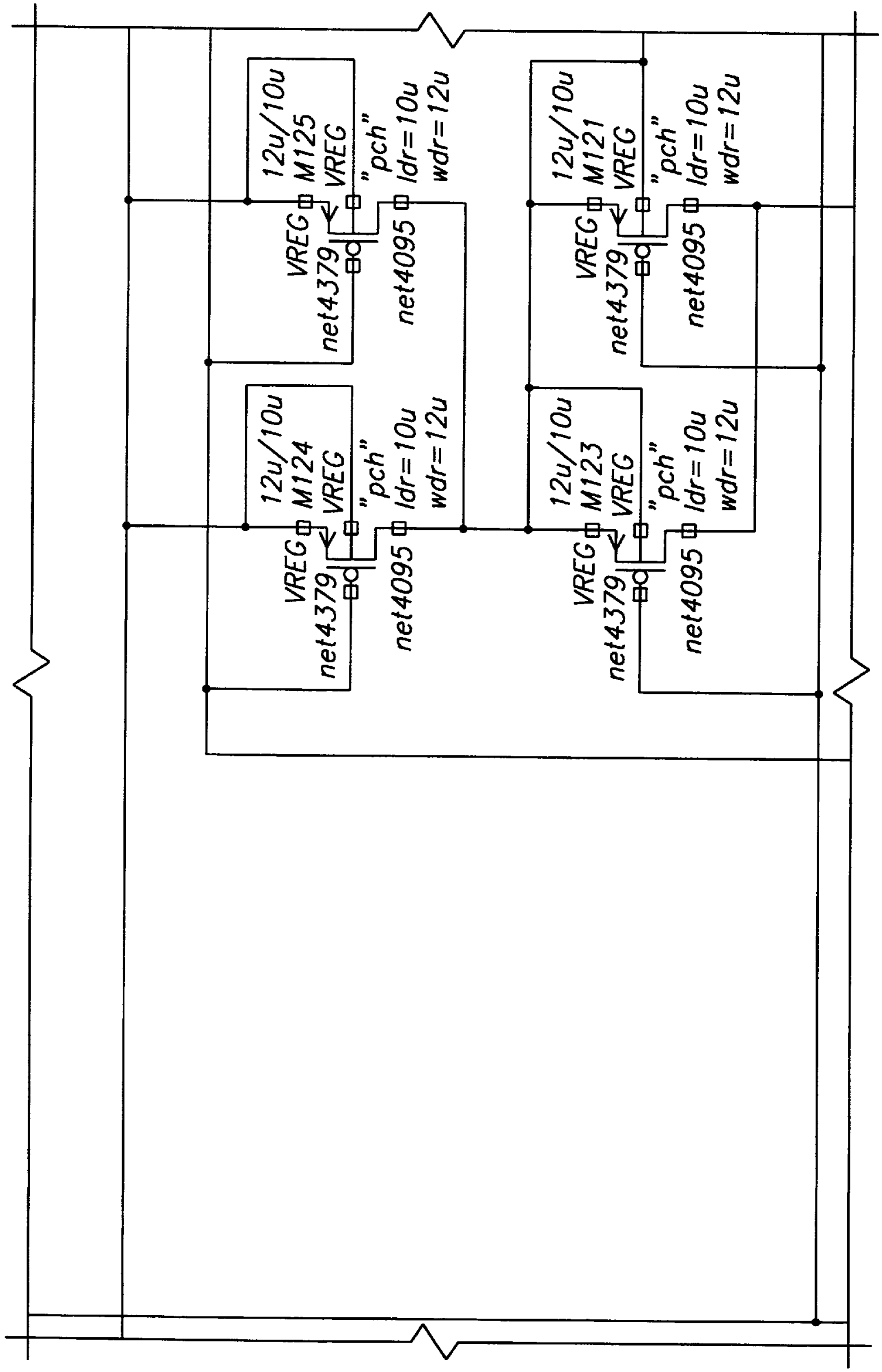
FIG. 8.050.3CE

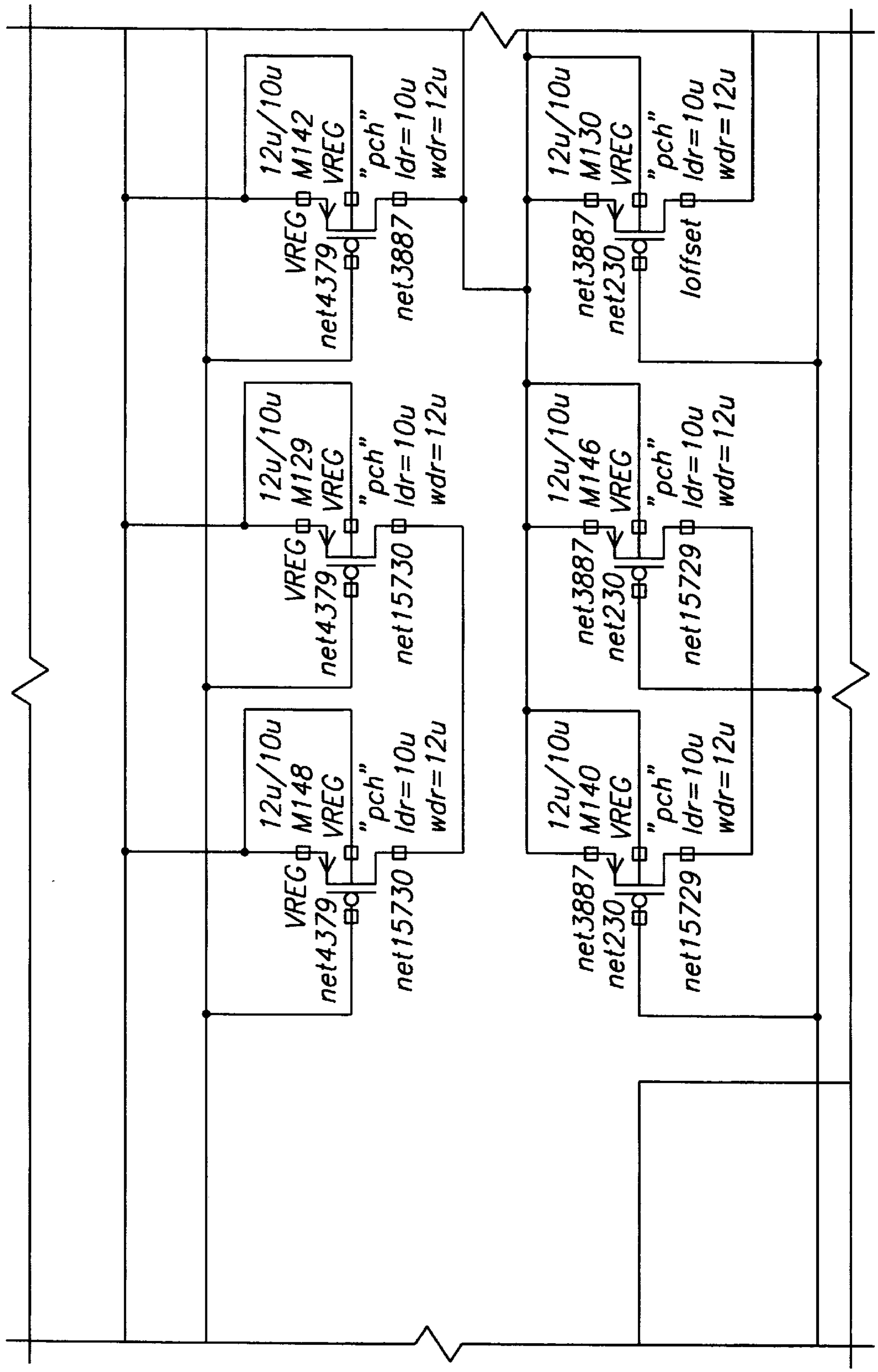
FIG 8.050.3CF

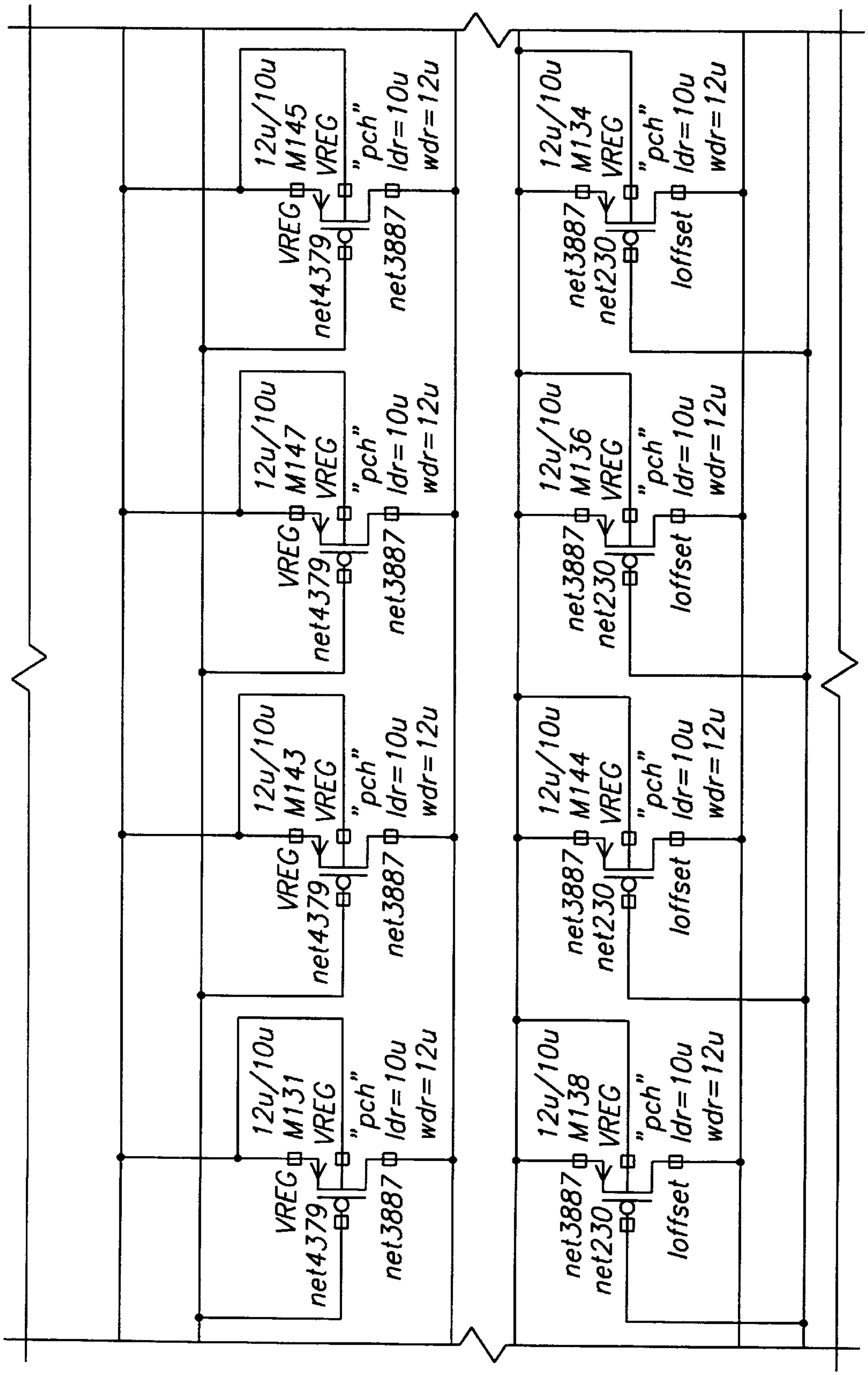
FIG. 8.050JLG

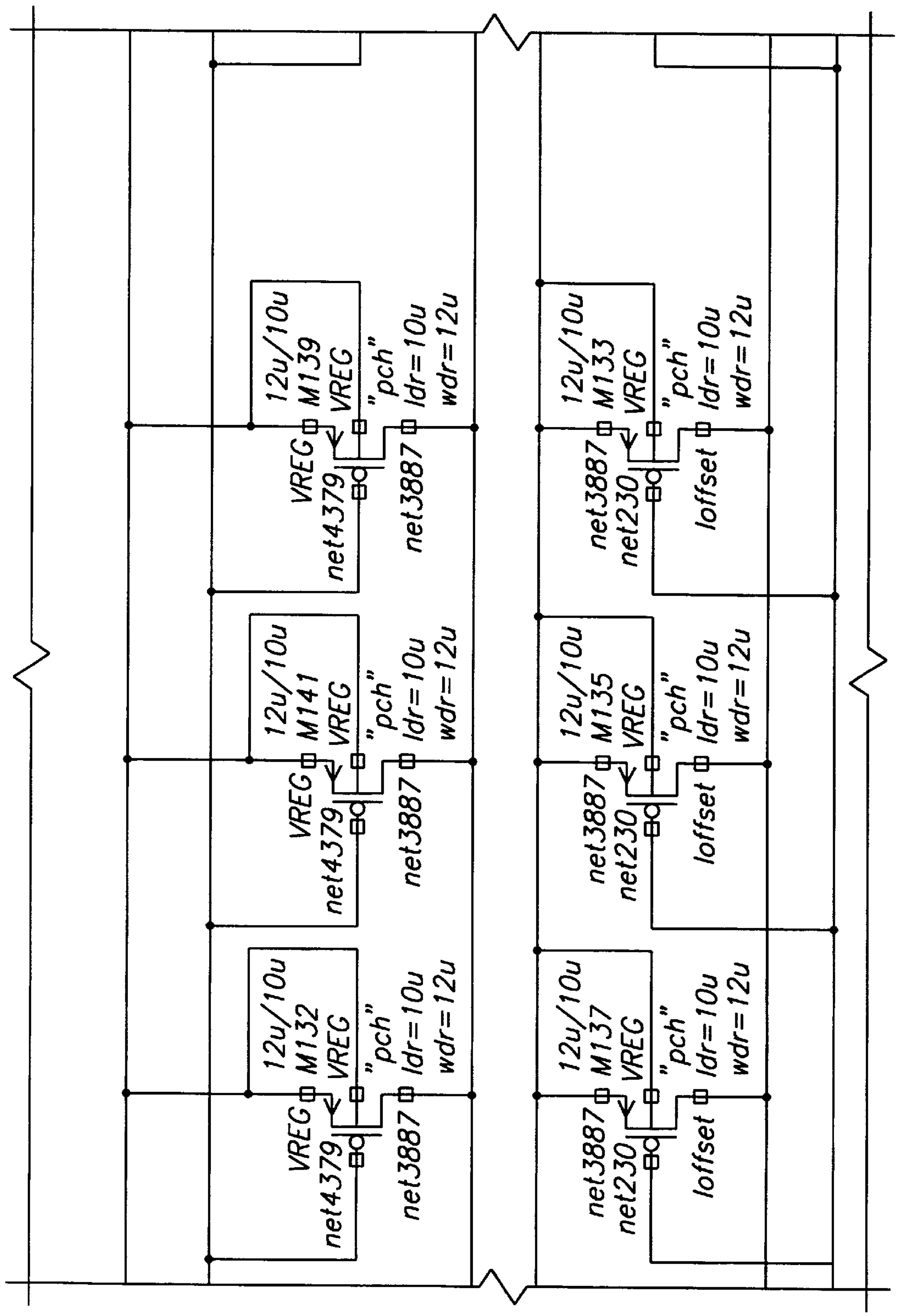
FIG. 8.050ECH

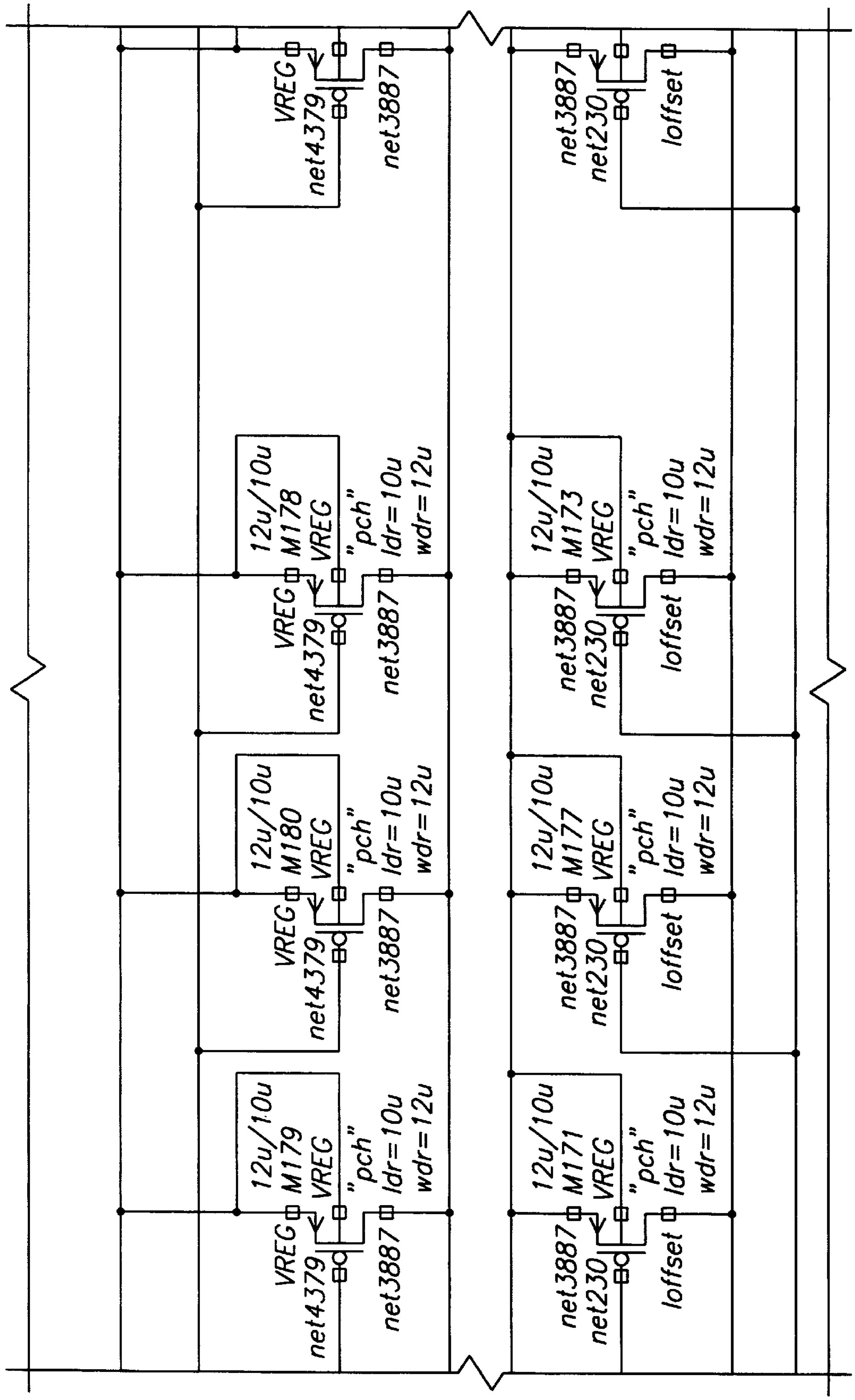
FIG. 8.050EII

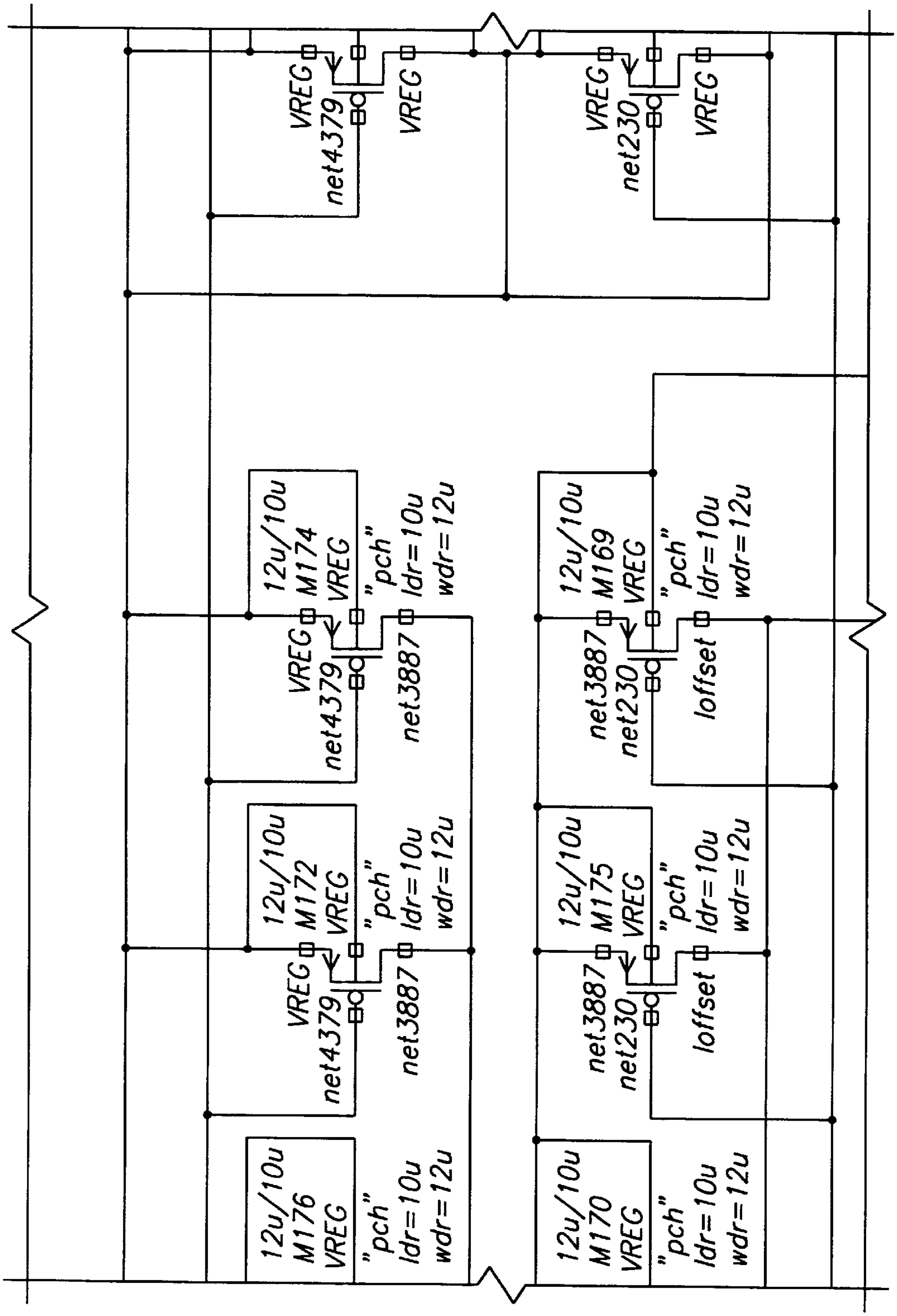
FIG. 8.0050EJ

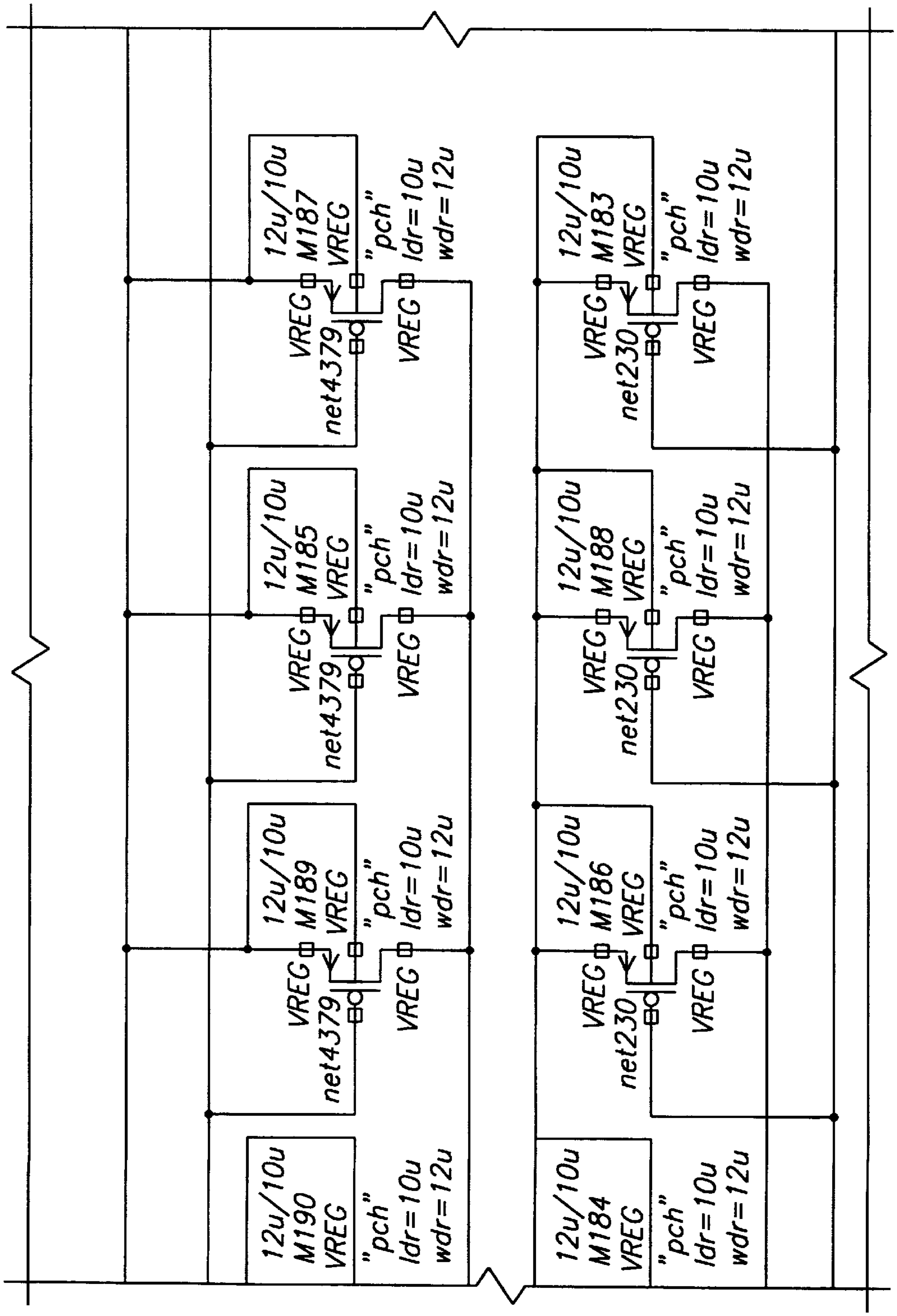
Fig. 8.050.3CK

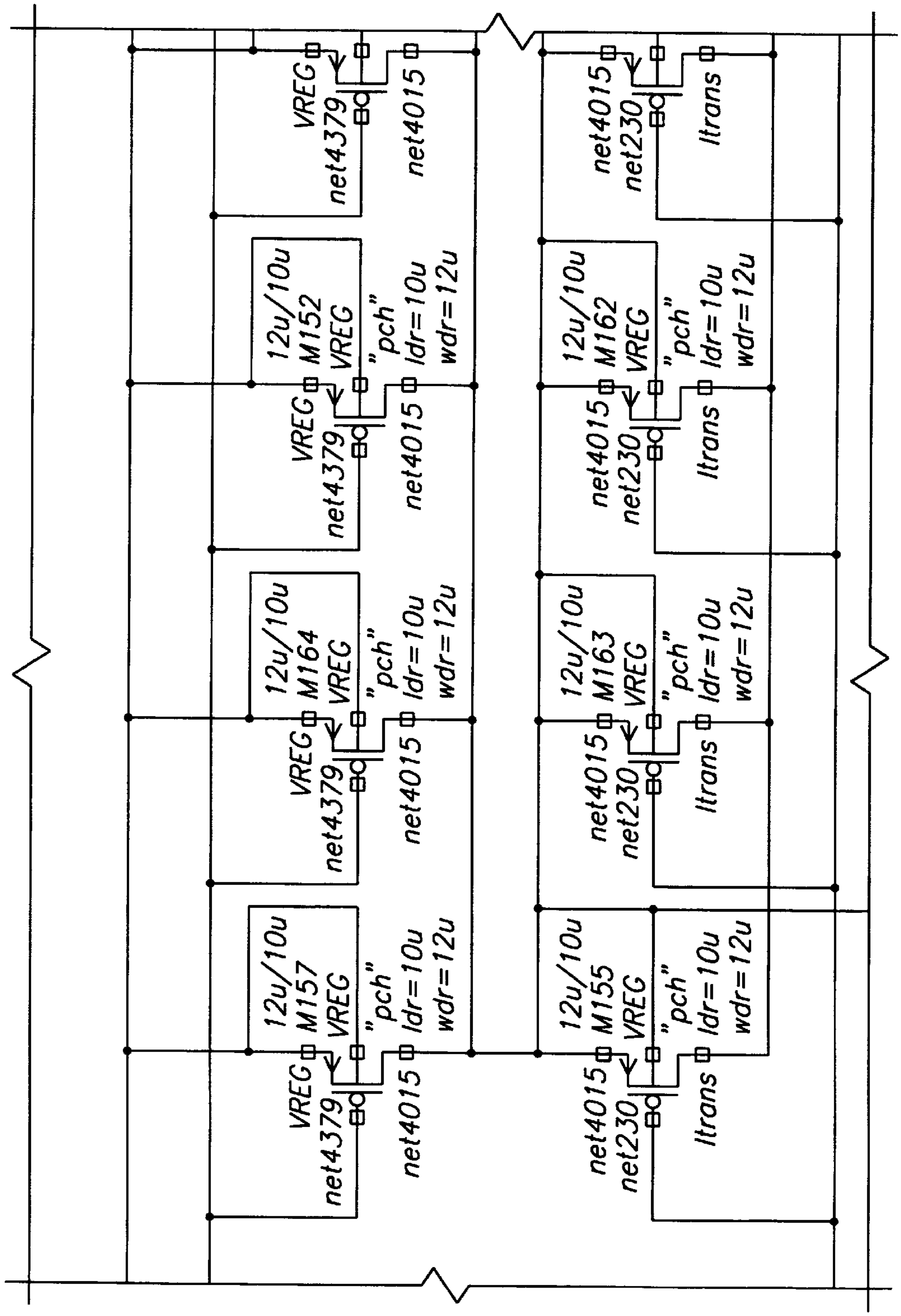
Fig 8.050JL

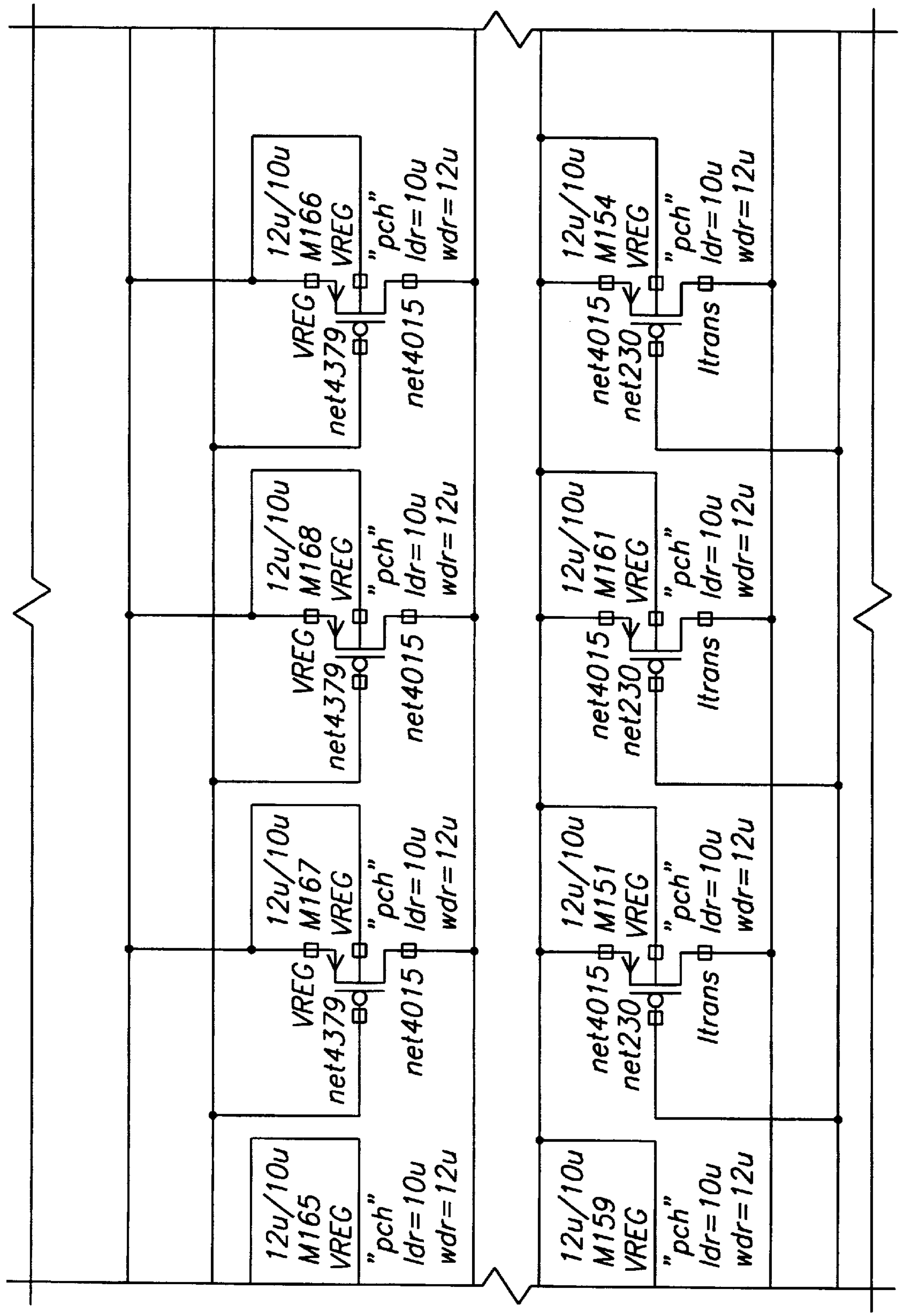
FIG. 8.050ECM

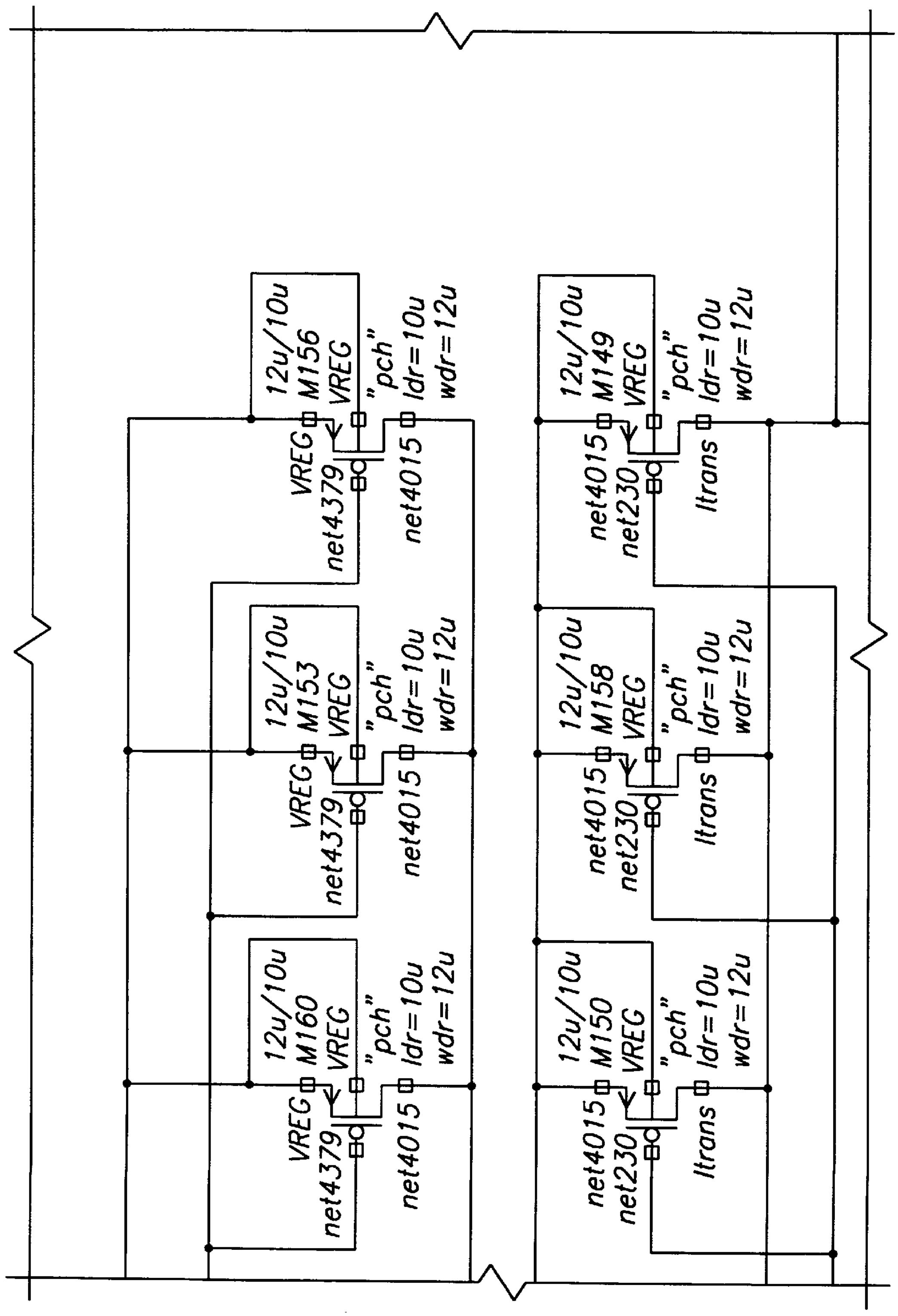
FIG. 8.050.3CN

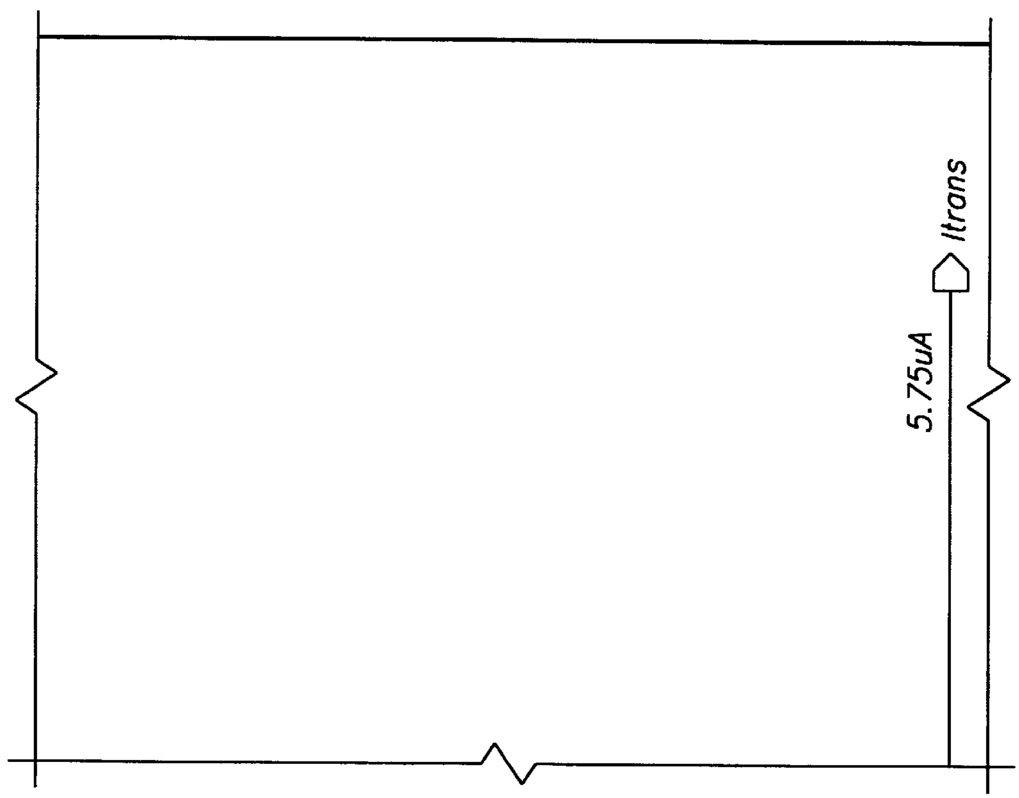
FIG. 8.0503C0

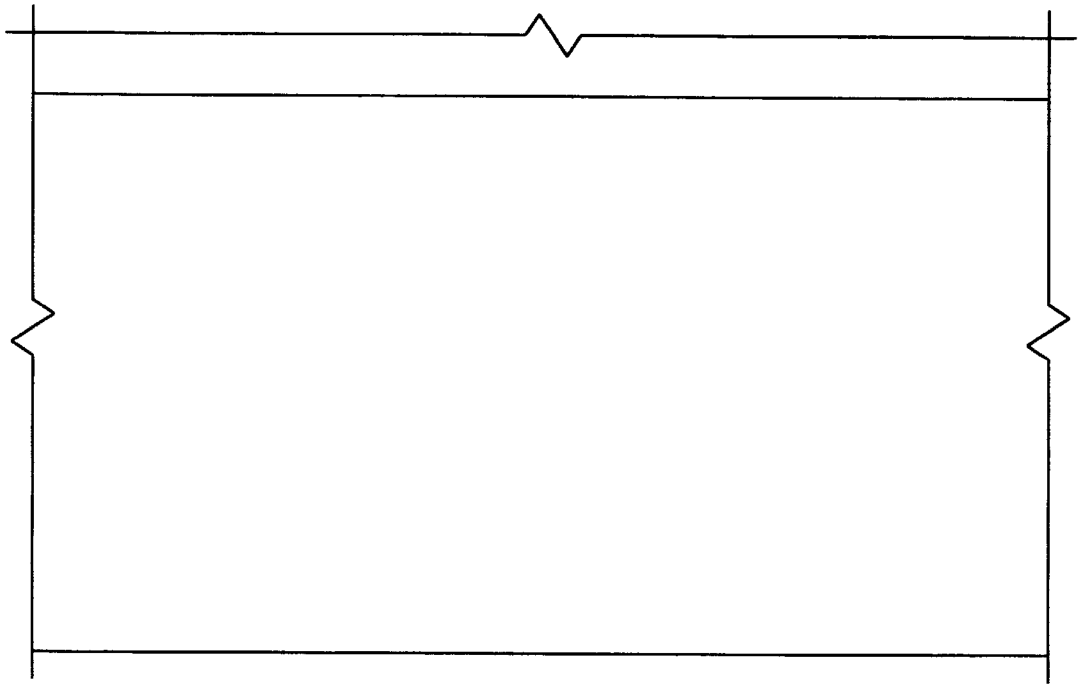
Fig 8.0503DA

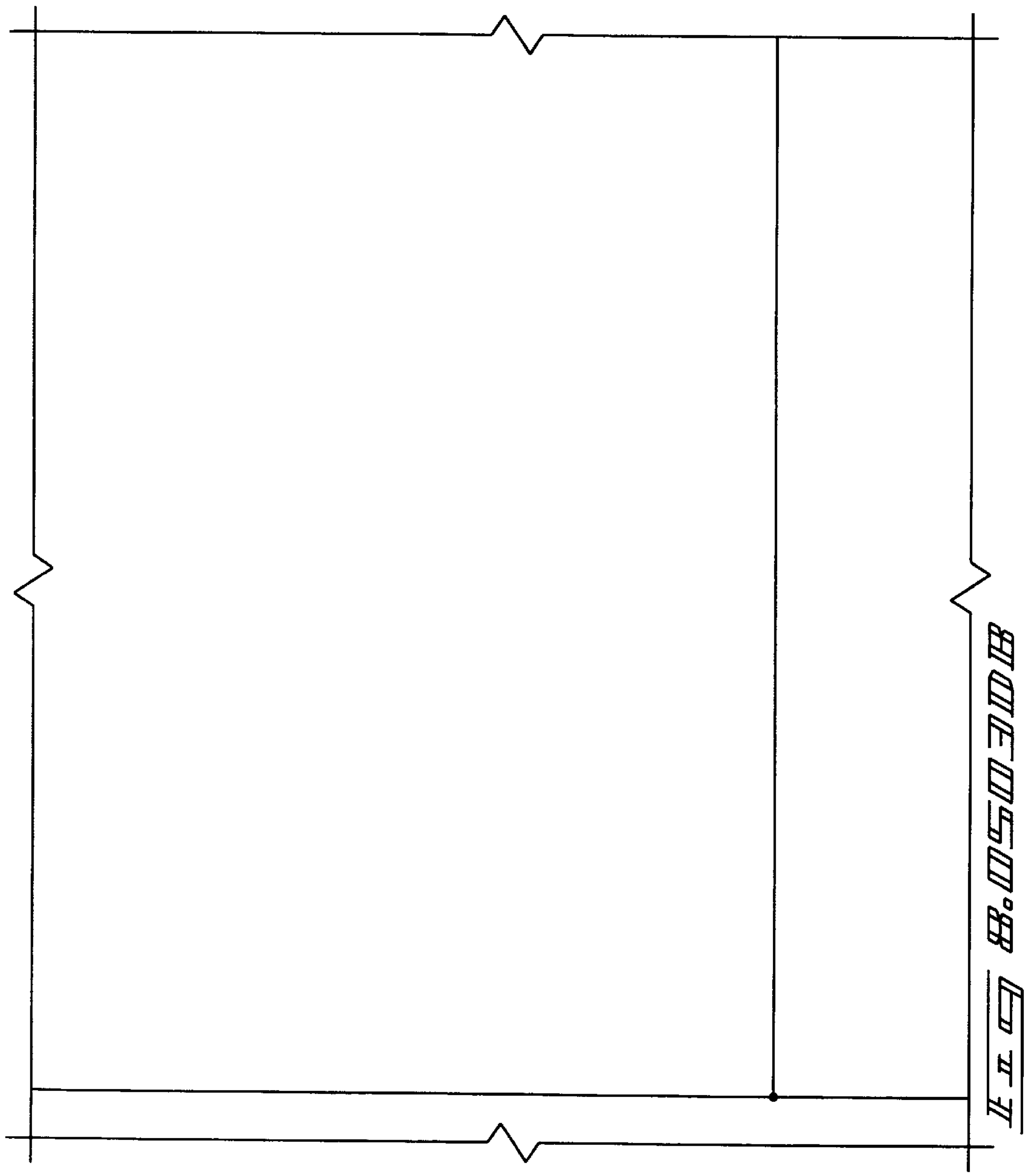
FIG. 8.05030B

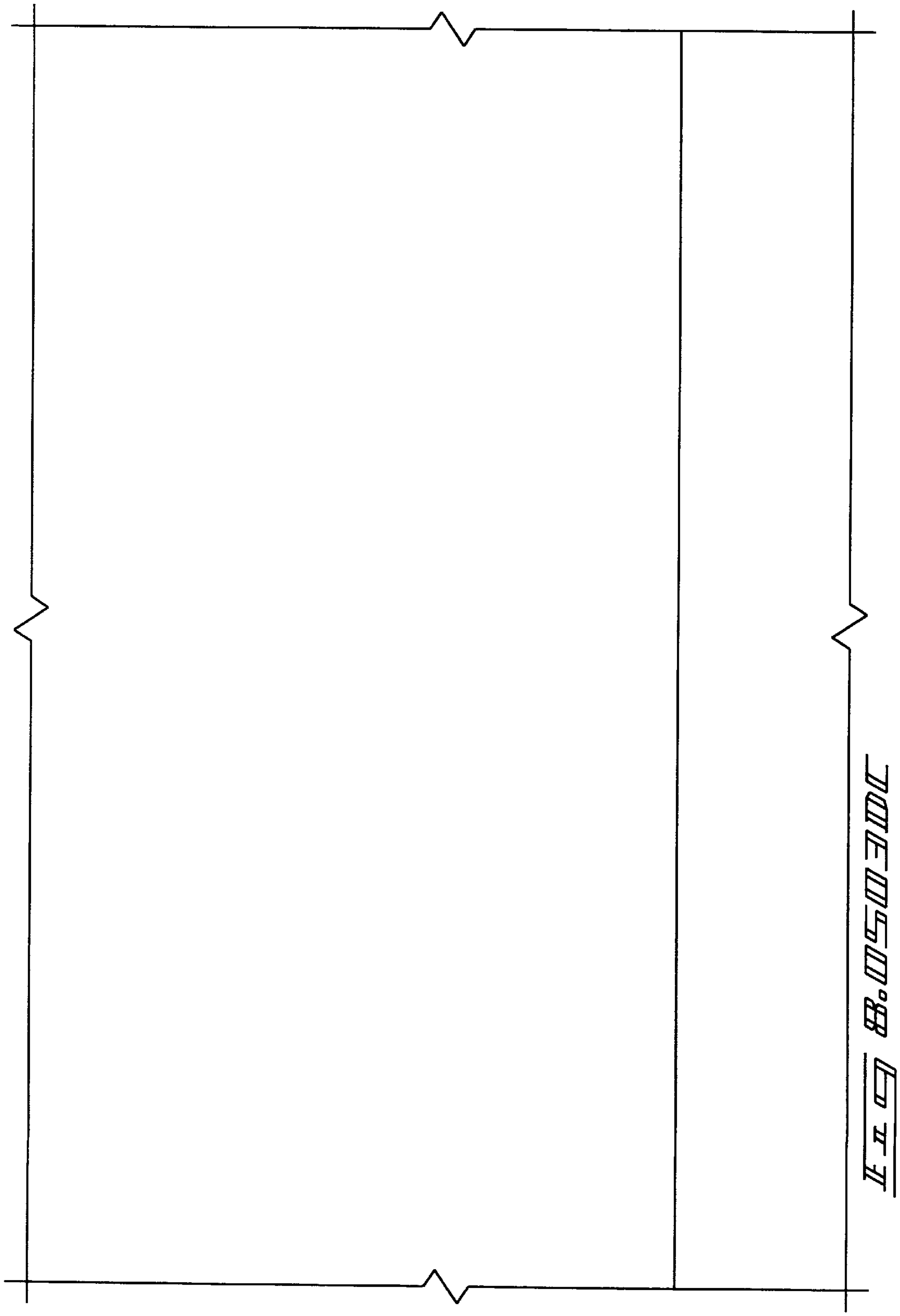
Fig 8.0503DC

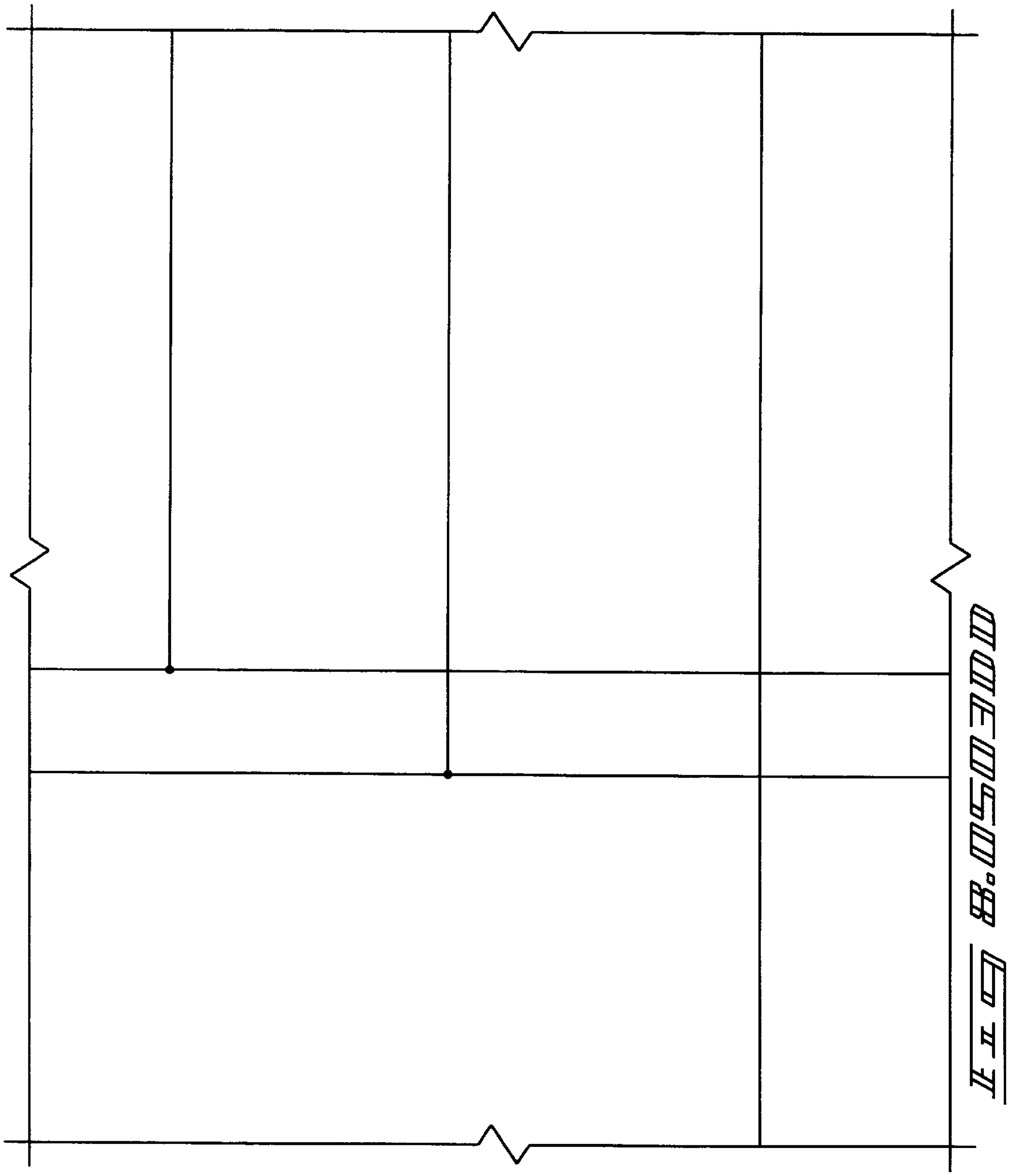
FIG. 8.0503DD

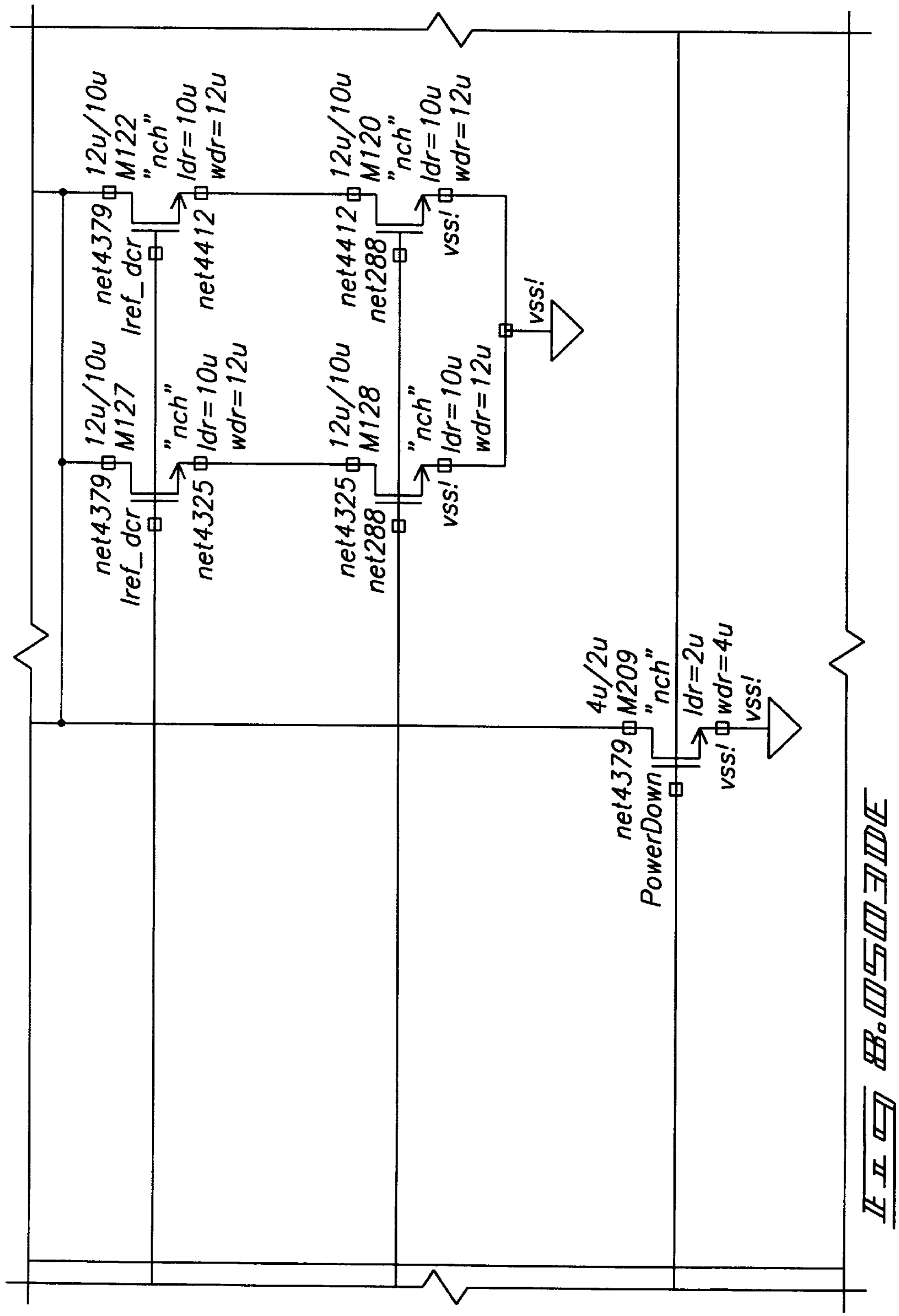
FIG. 8.0503DE

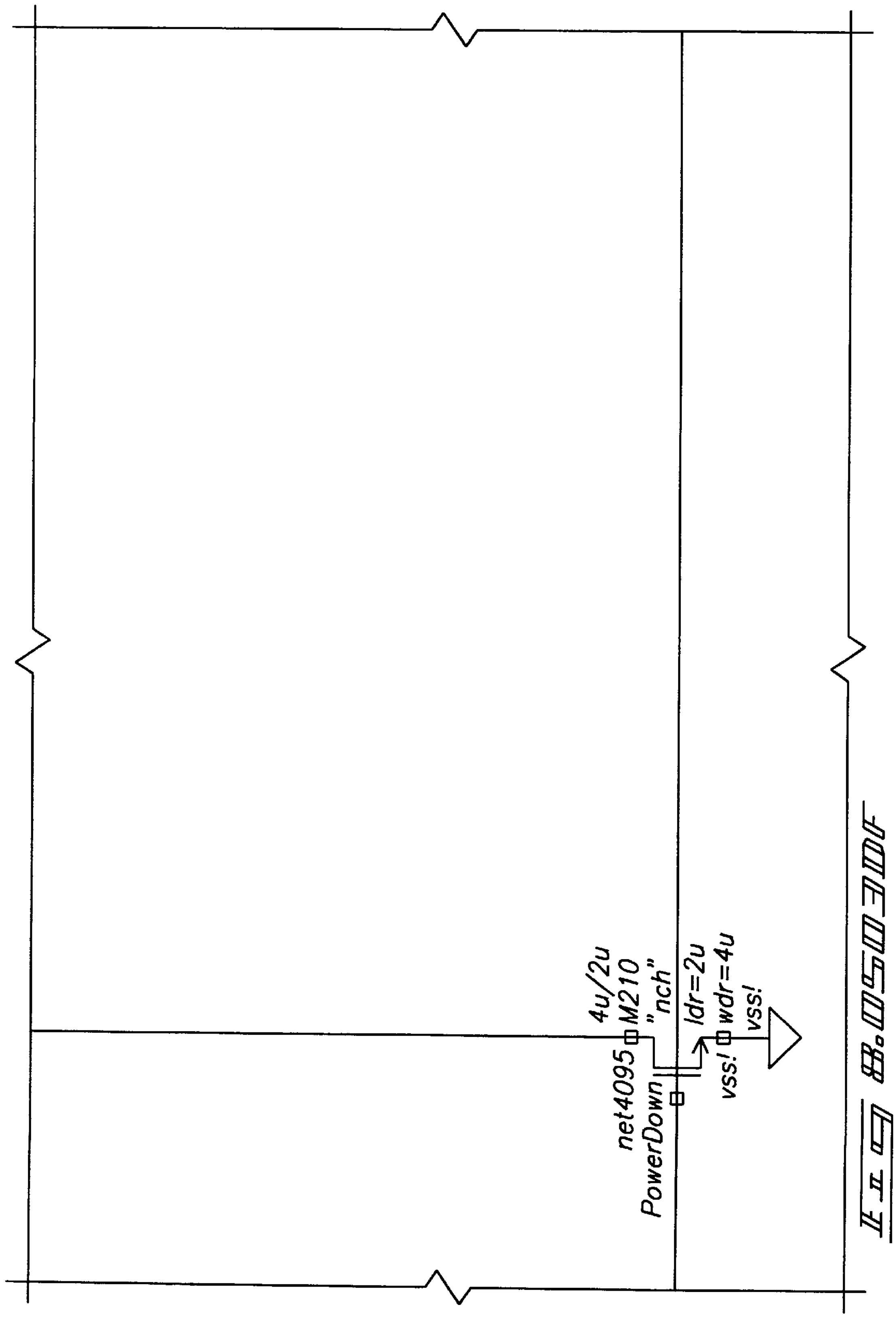
Fig. 8.050310F

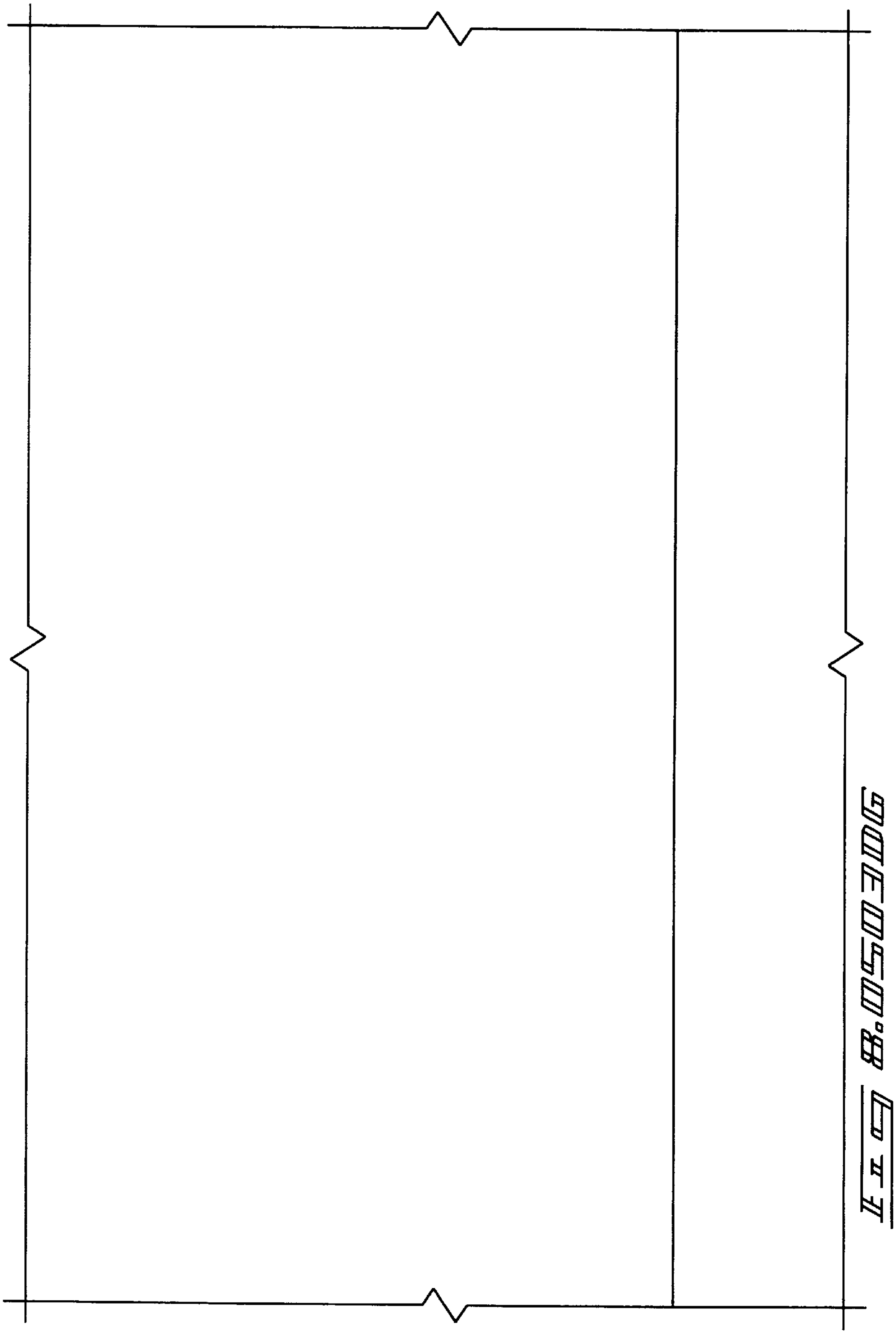
FIG. 8.0503DG

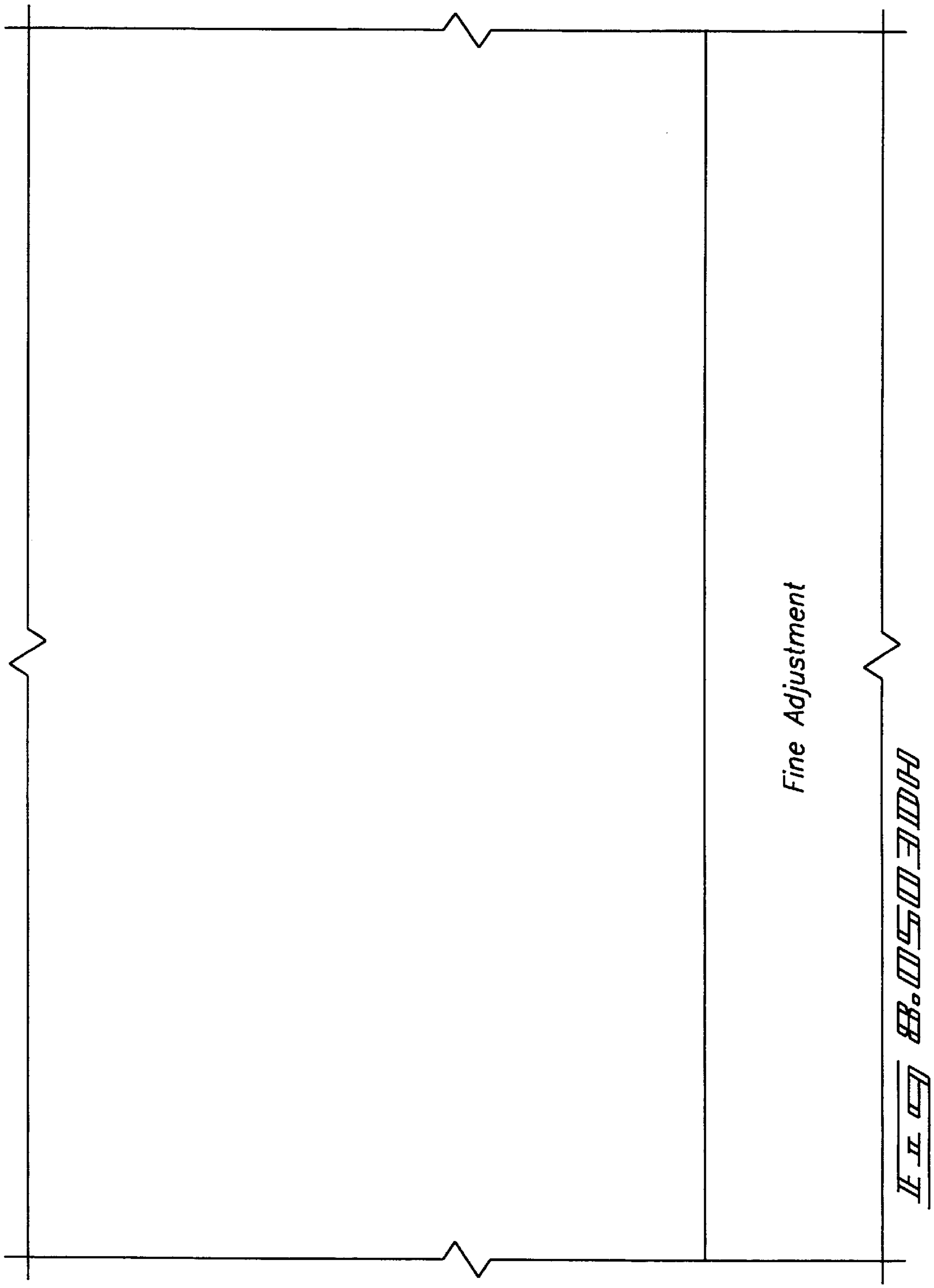
Fig. 8.0503AH

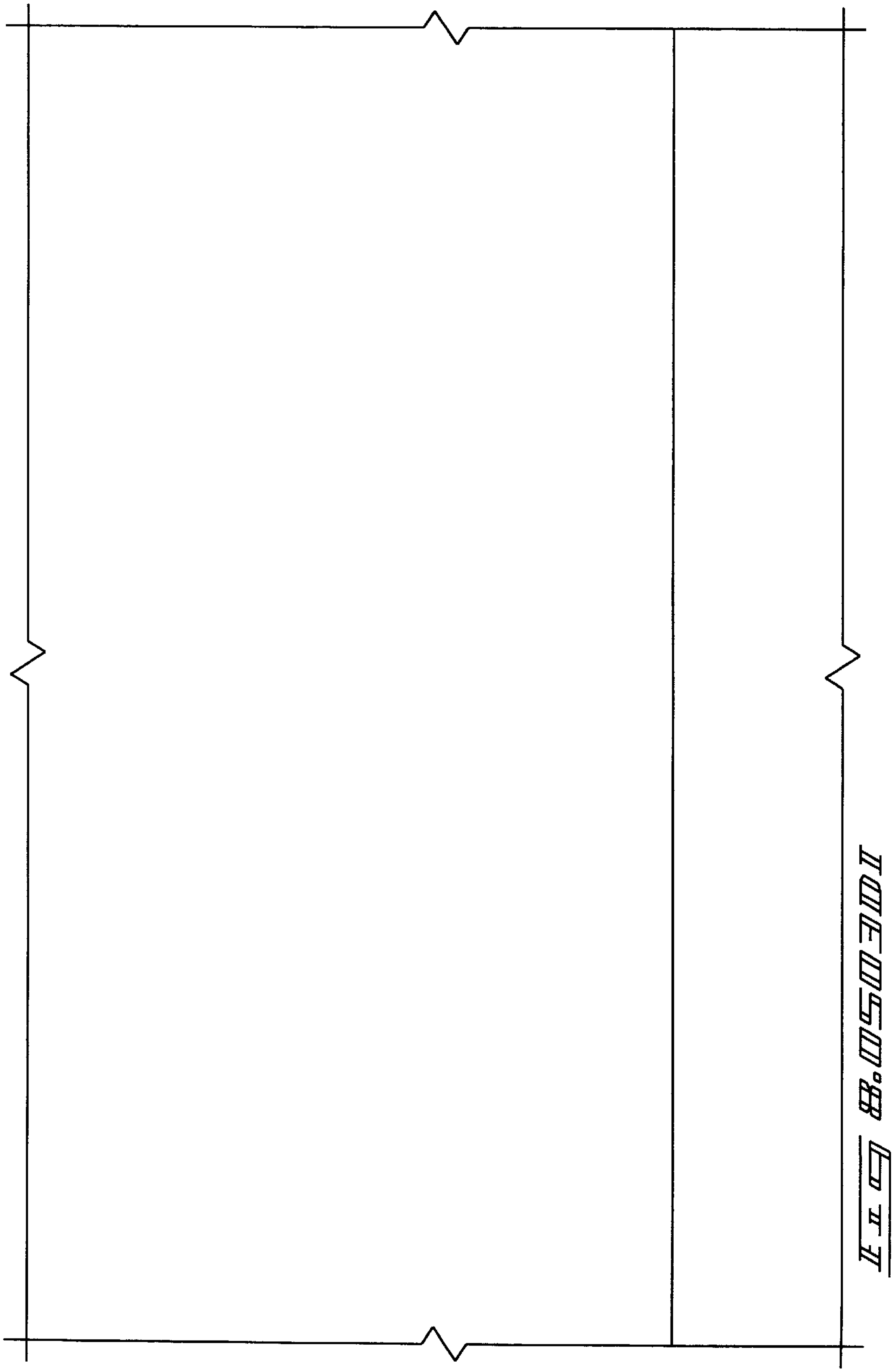
FIG. 8.050301

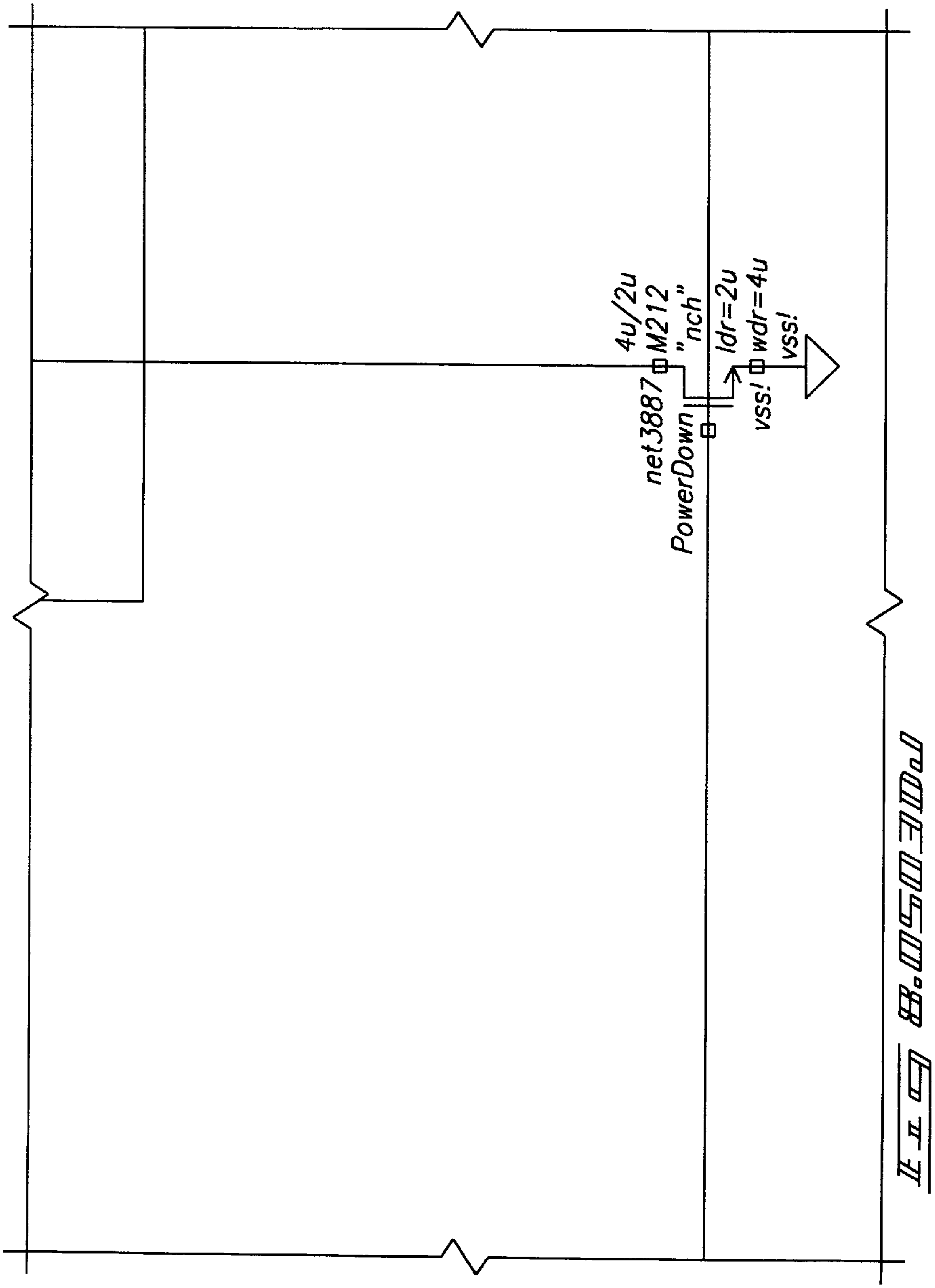
Fig. 8.0503DJ

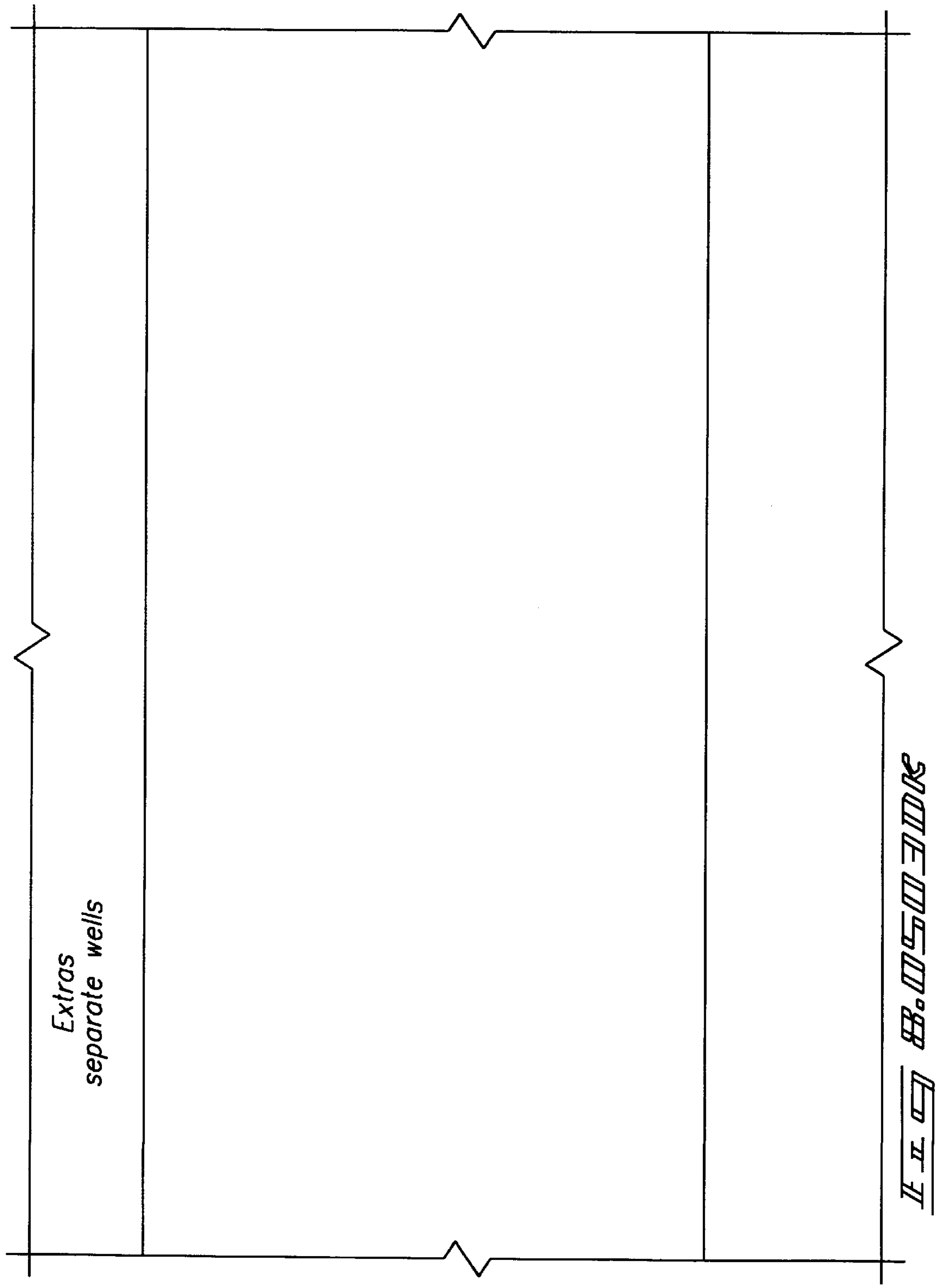
Fig. 8.0503DK

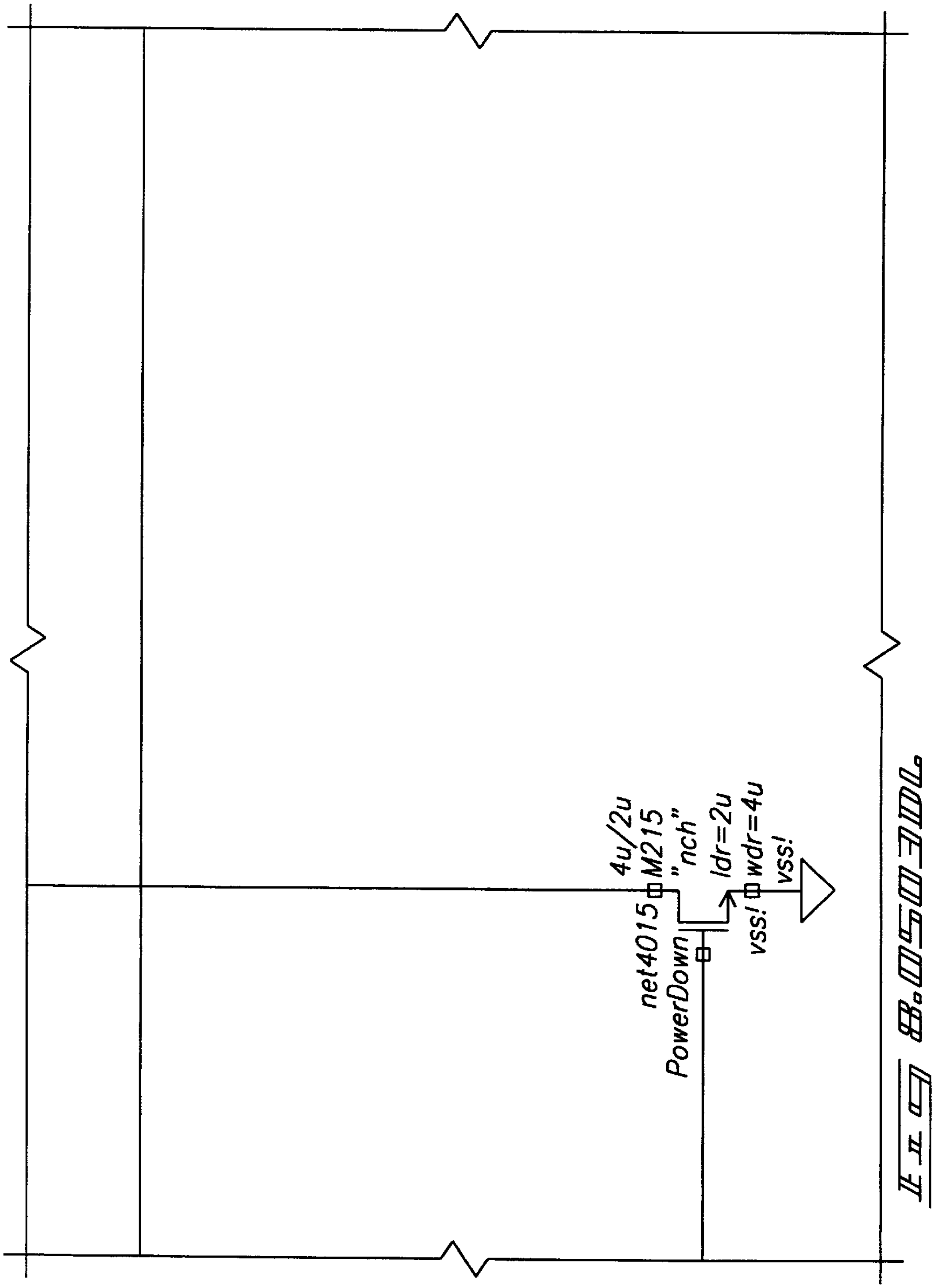
FIG. 8.00503DL

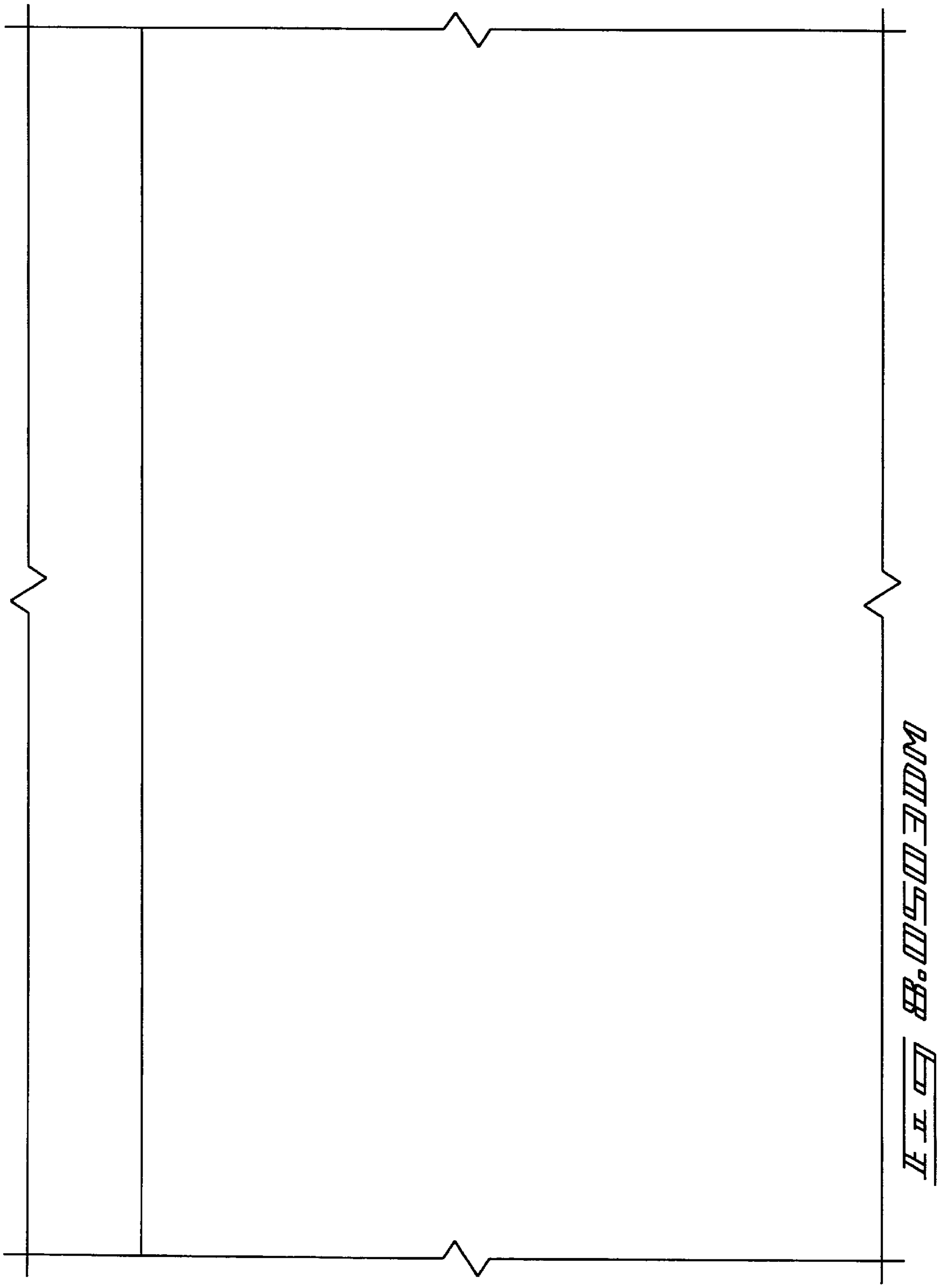
FIG. 8.0503DM

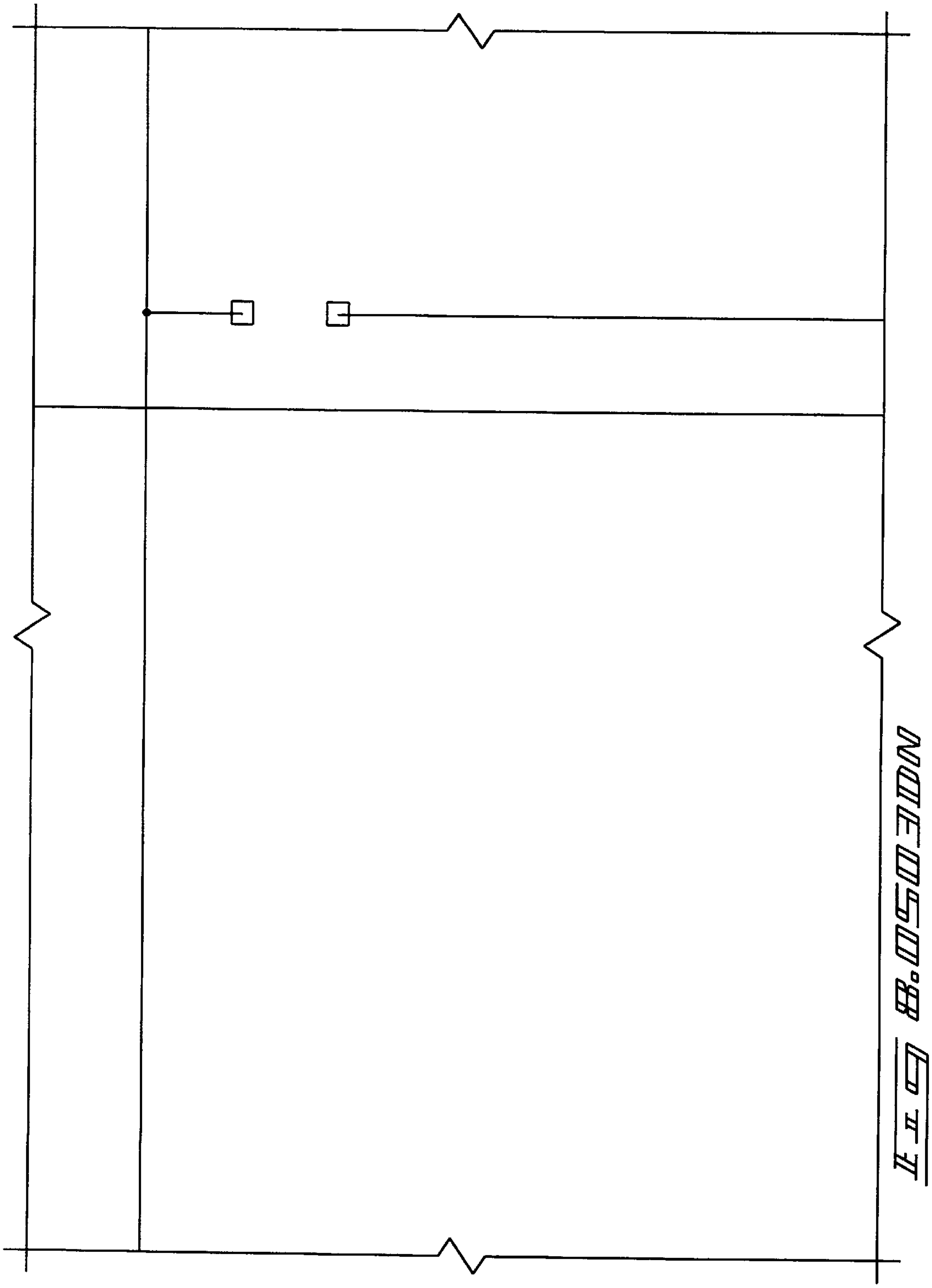
FIG. 8.0503DN

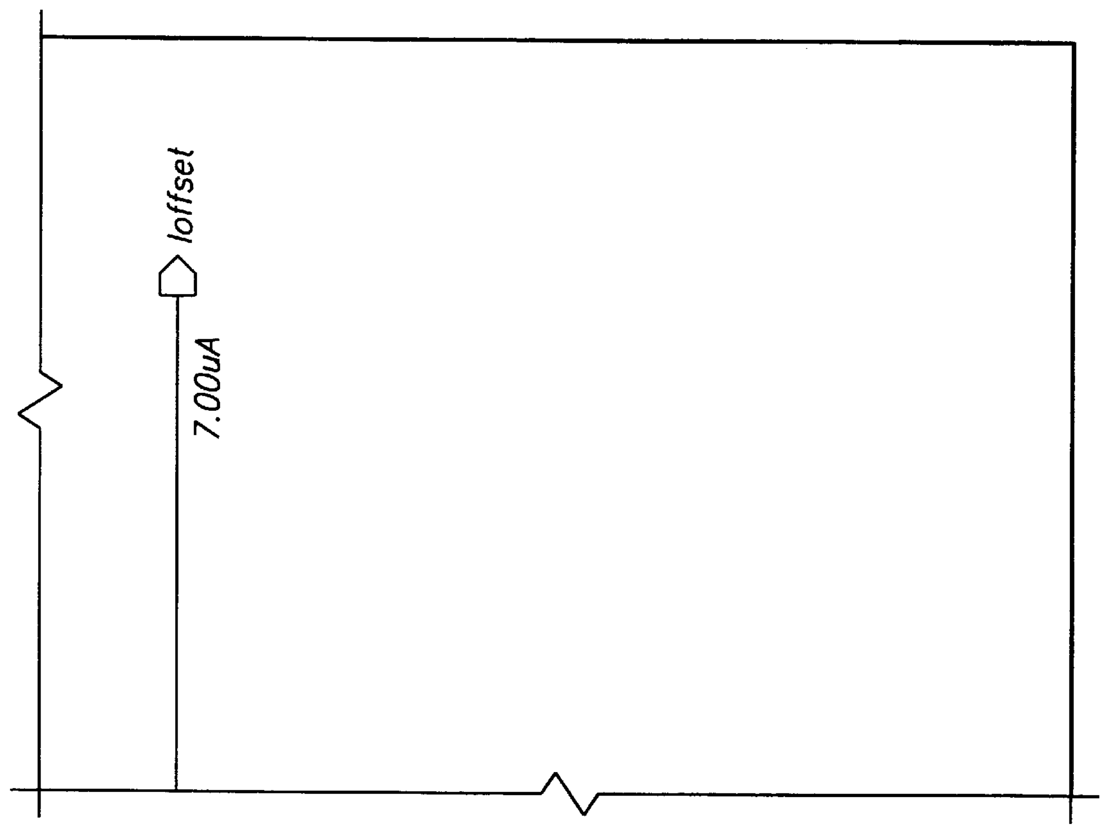
FIG. 8.0503D0

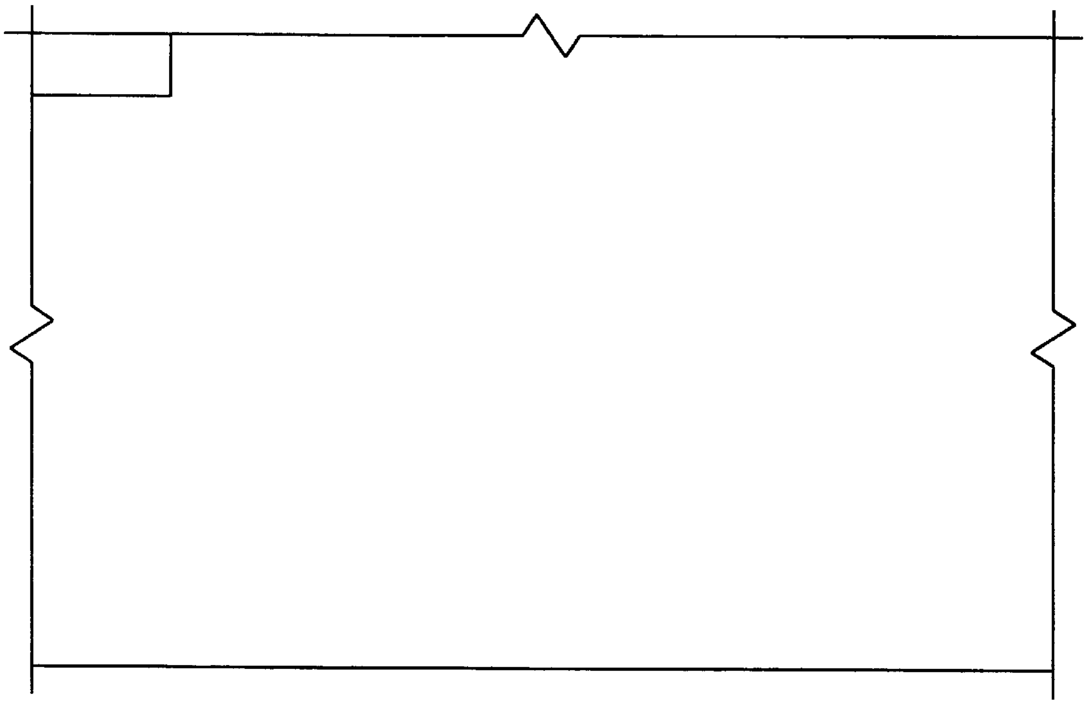
Fig. 8.0503EA

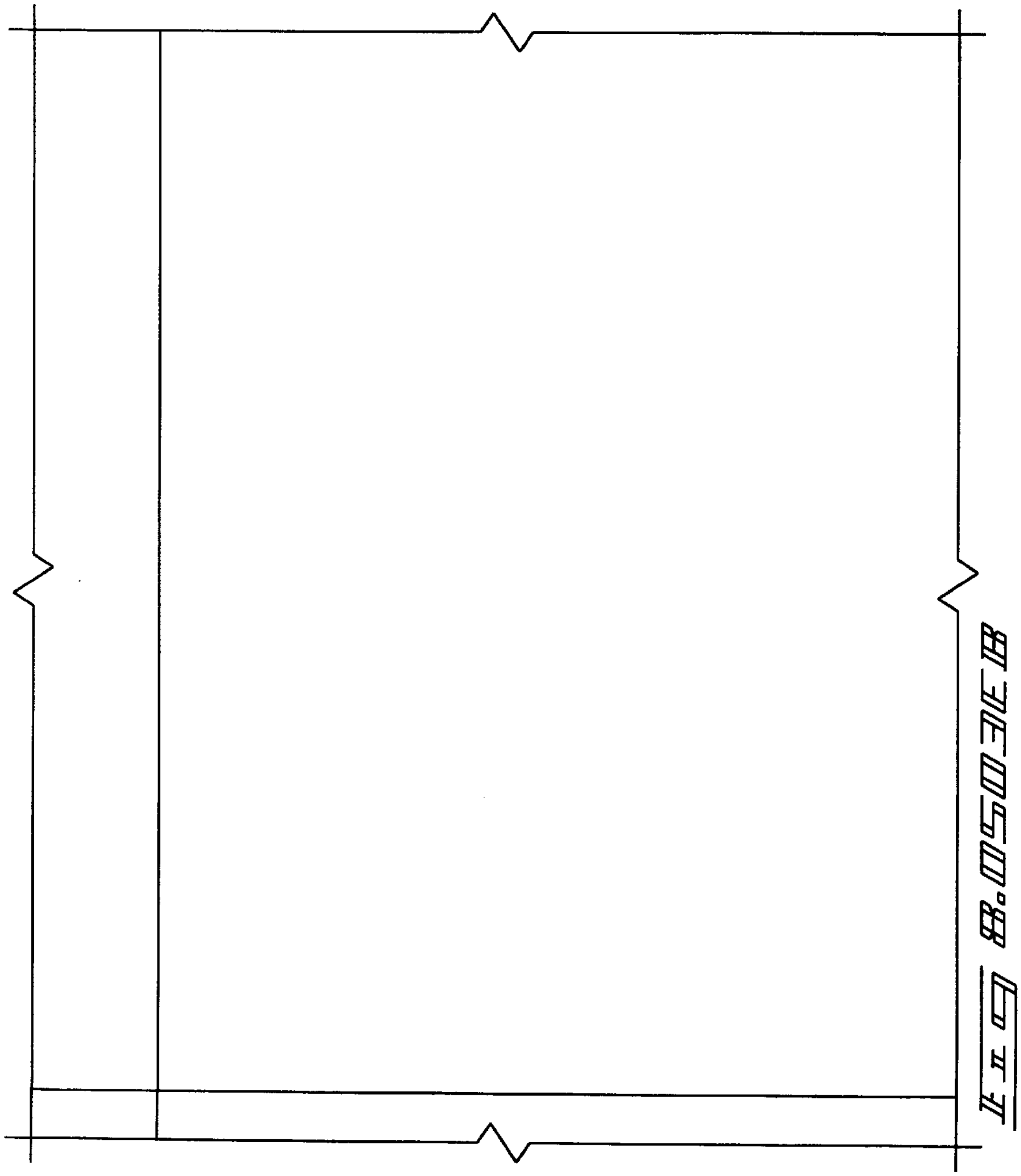
FIG. 8.0503EB

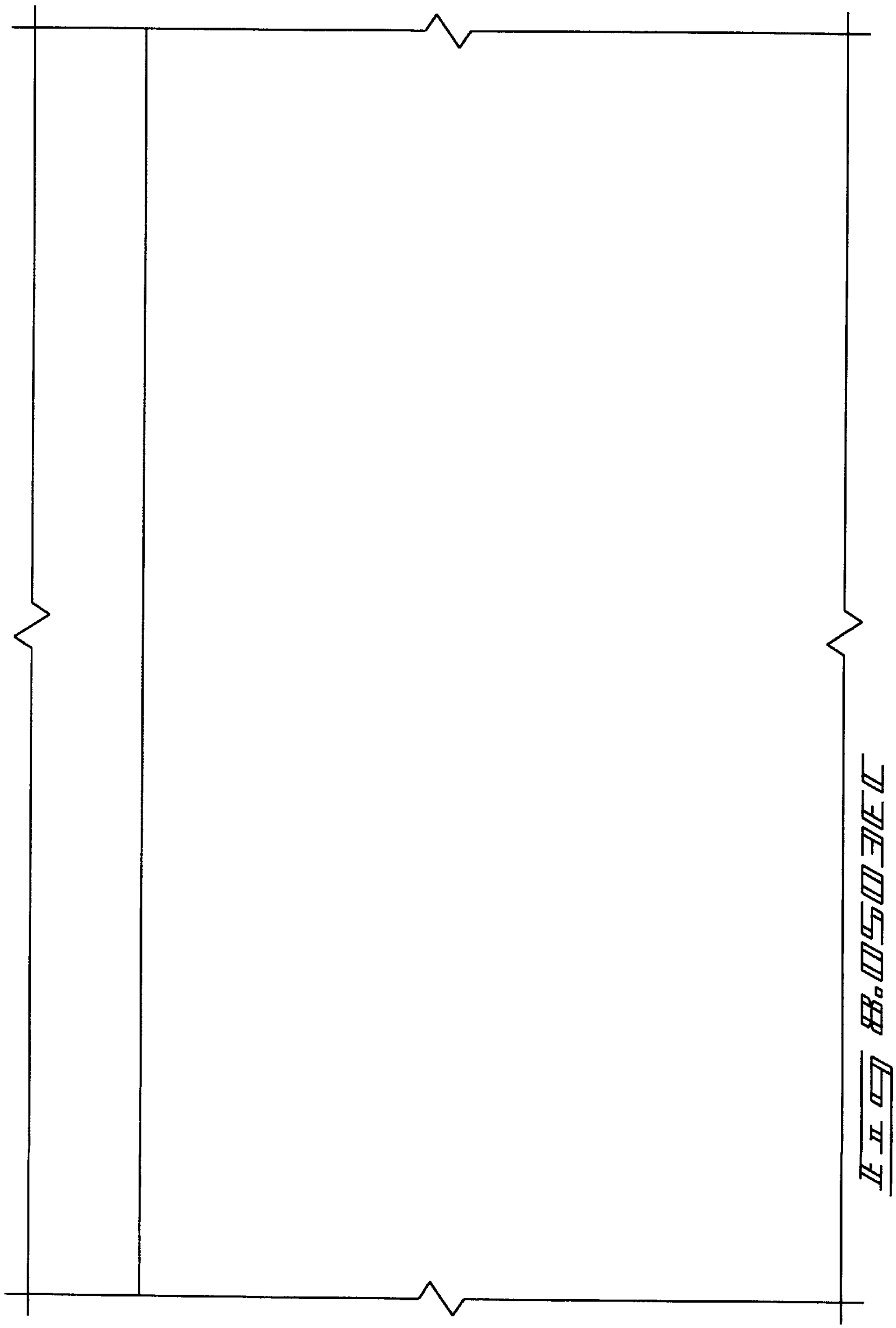
FIG. 8.0503EC

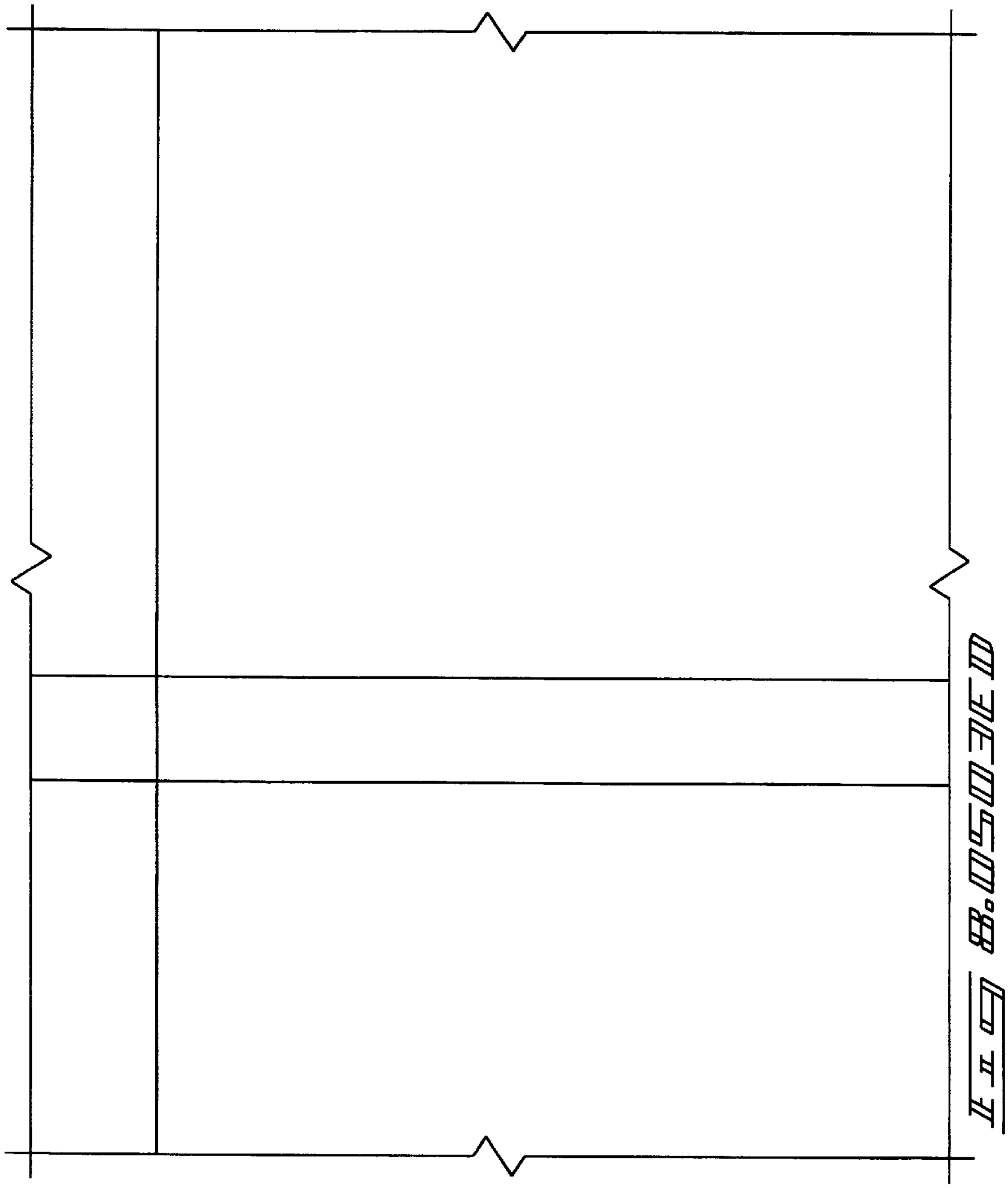
FIG. 8.0503ED

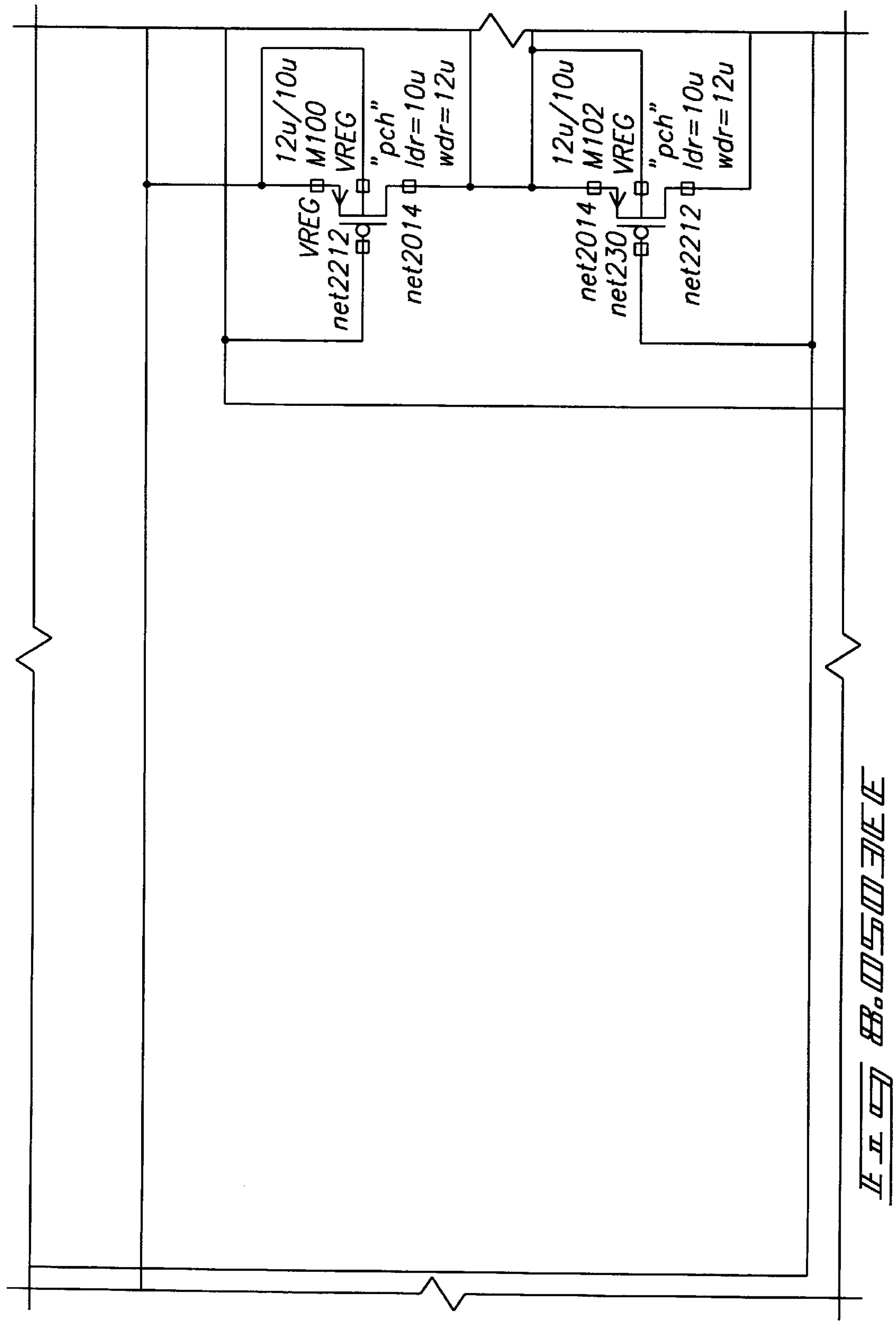
FIG. 8.050EE

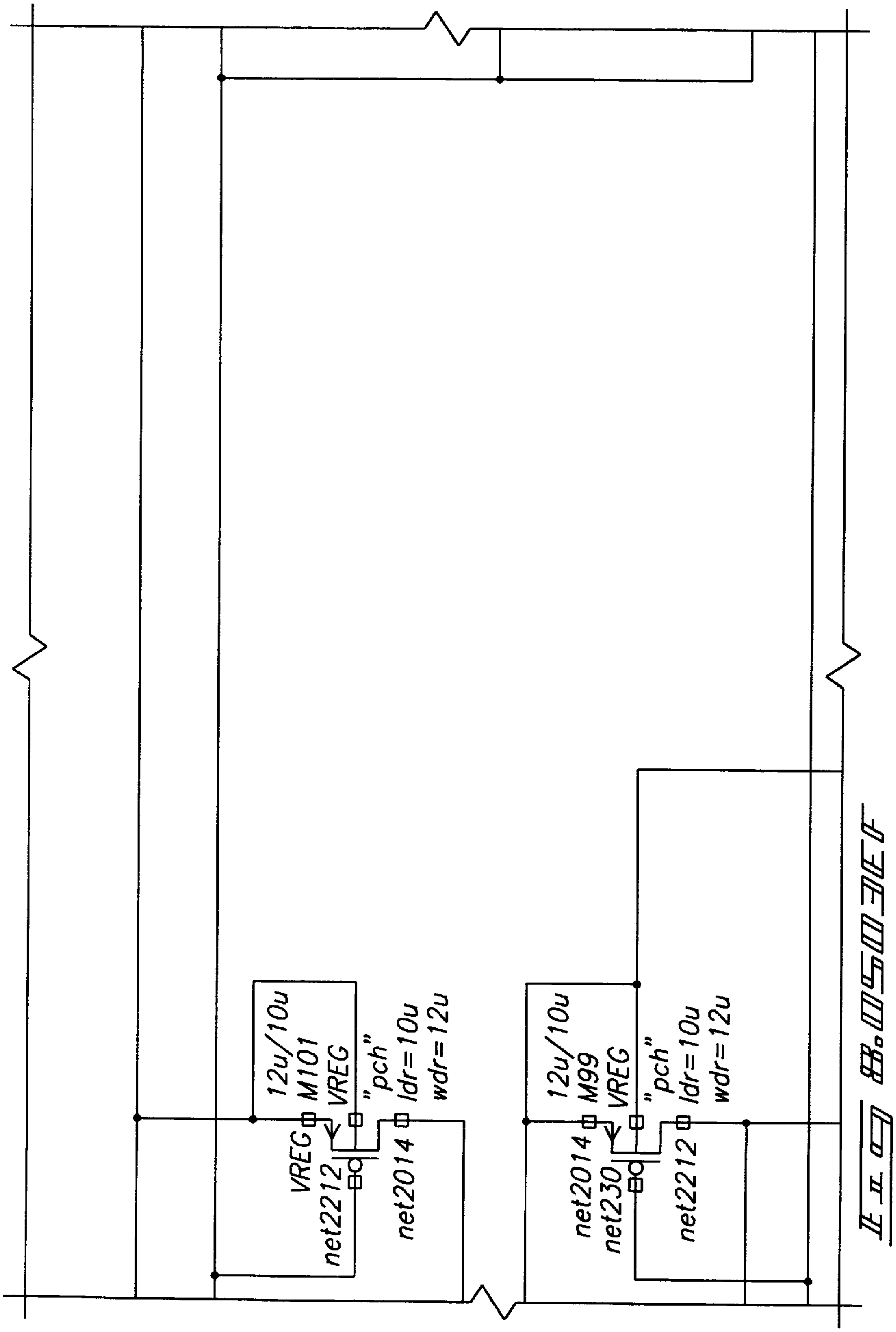
Fig. 8.050EF

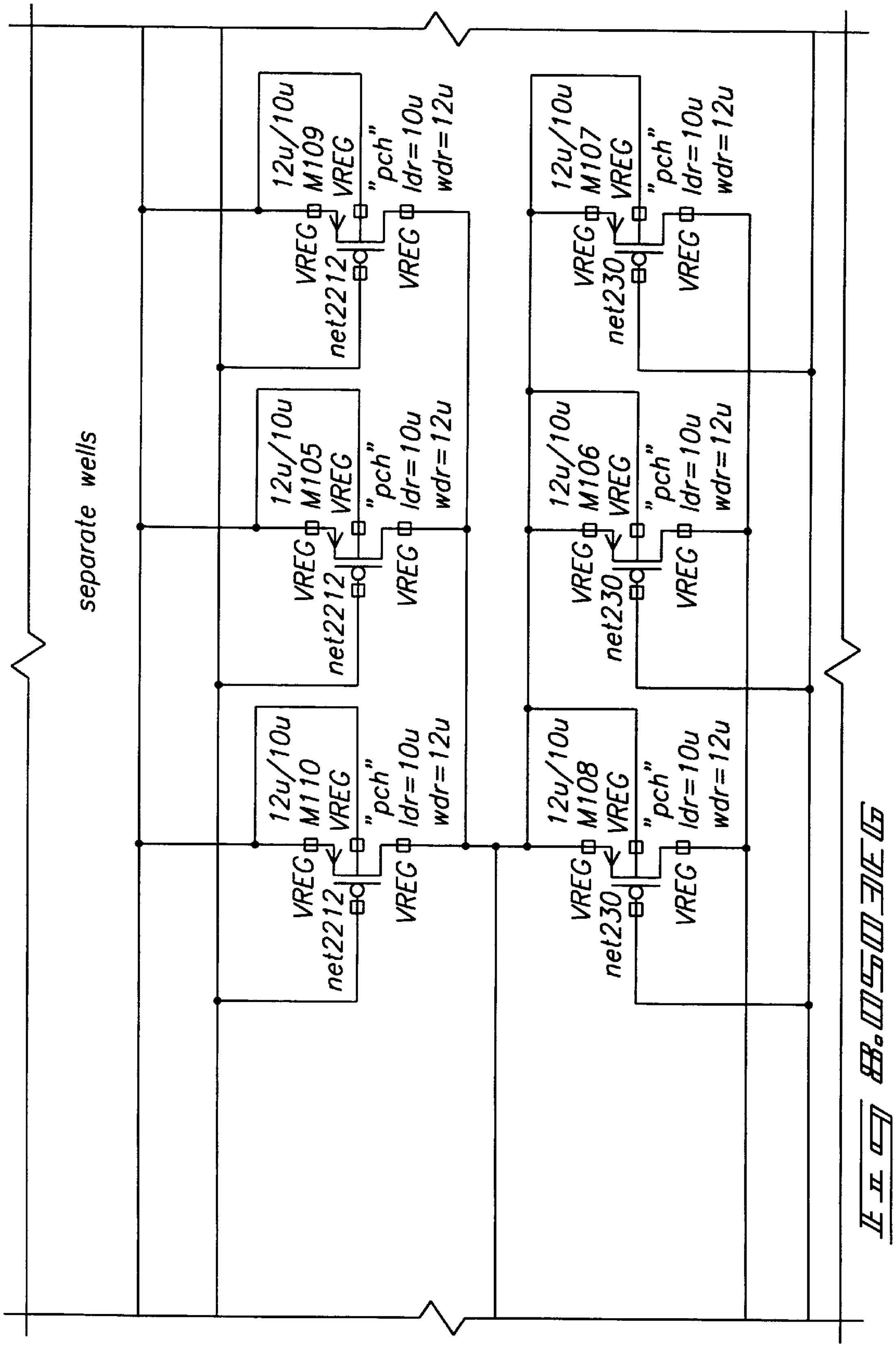
FIG. 8.050JEG

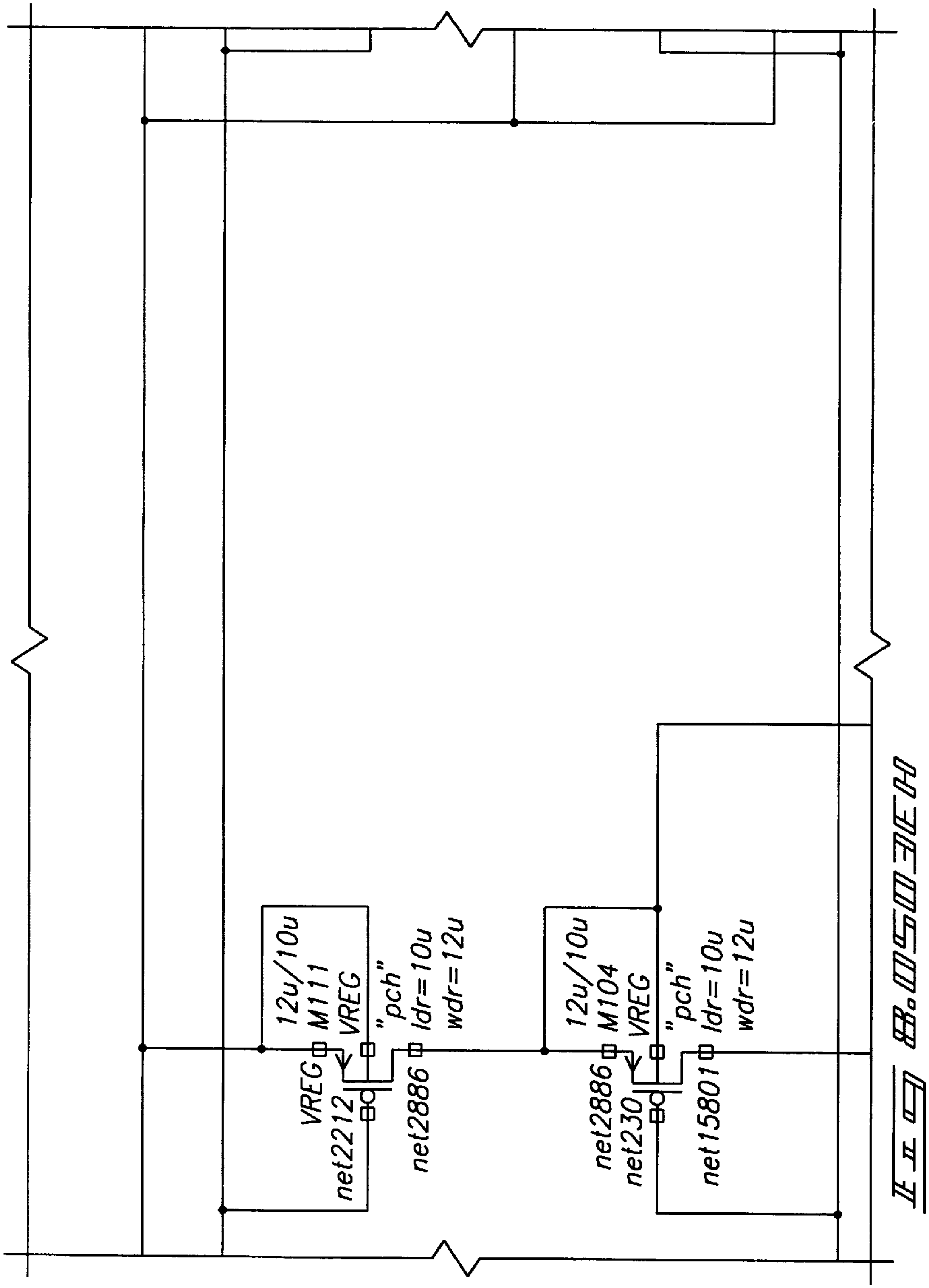
FIG. 8.0503EH

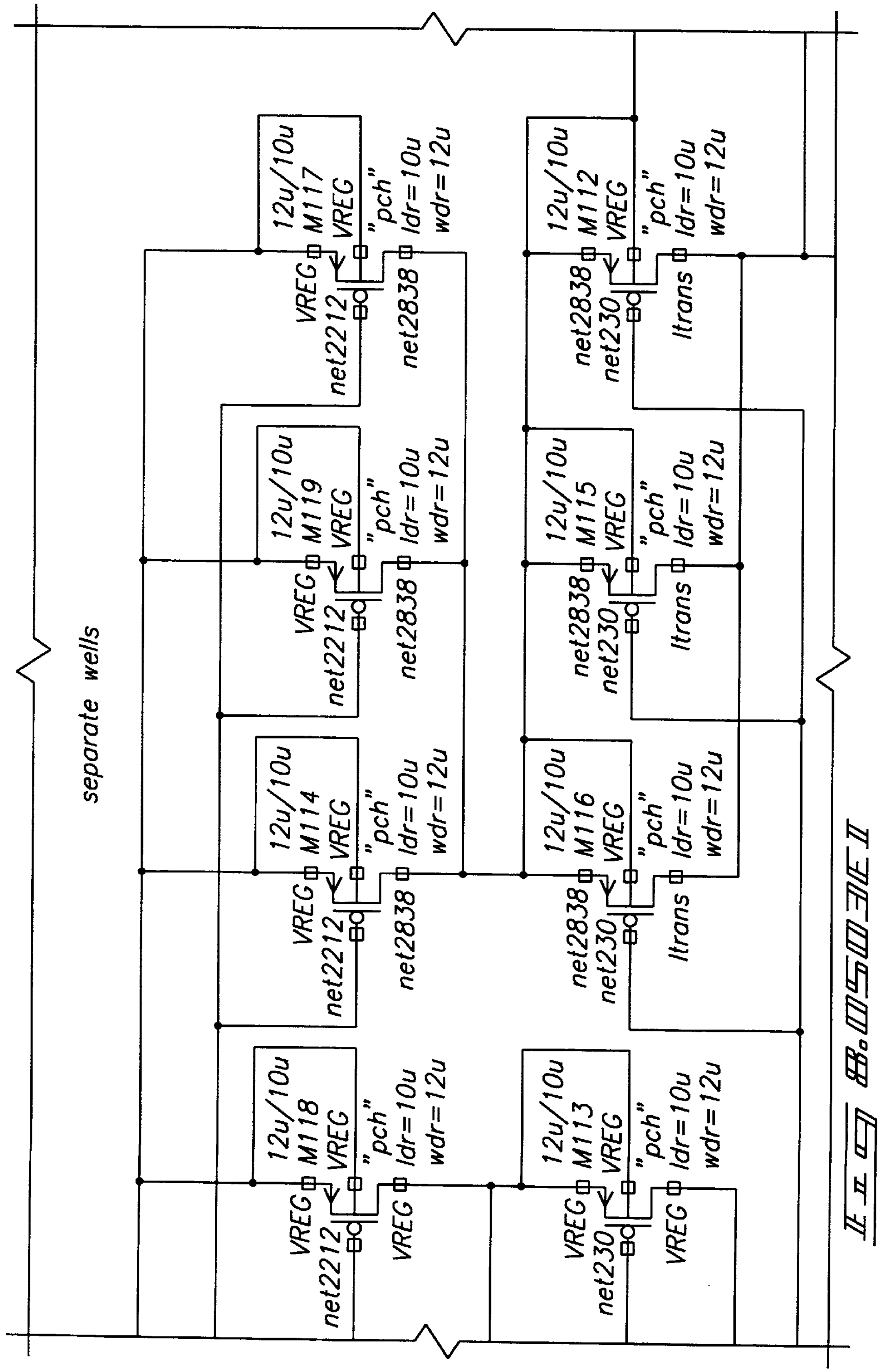
FIG. 8.050E I

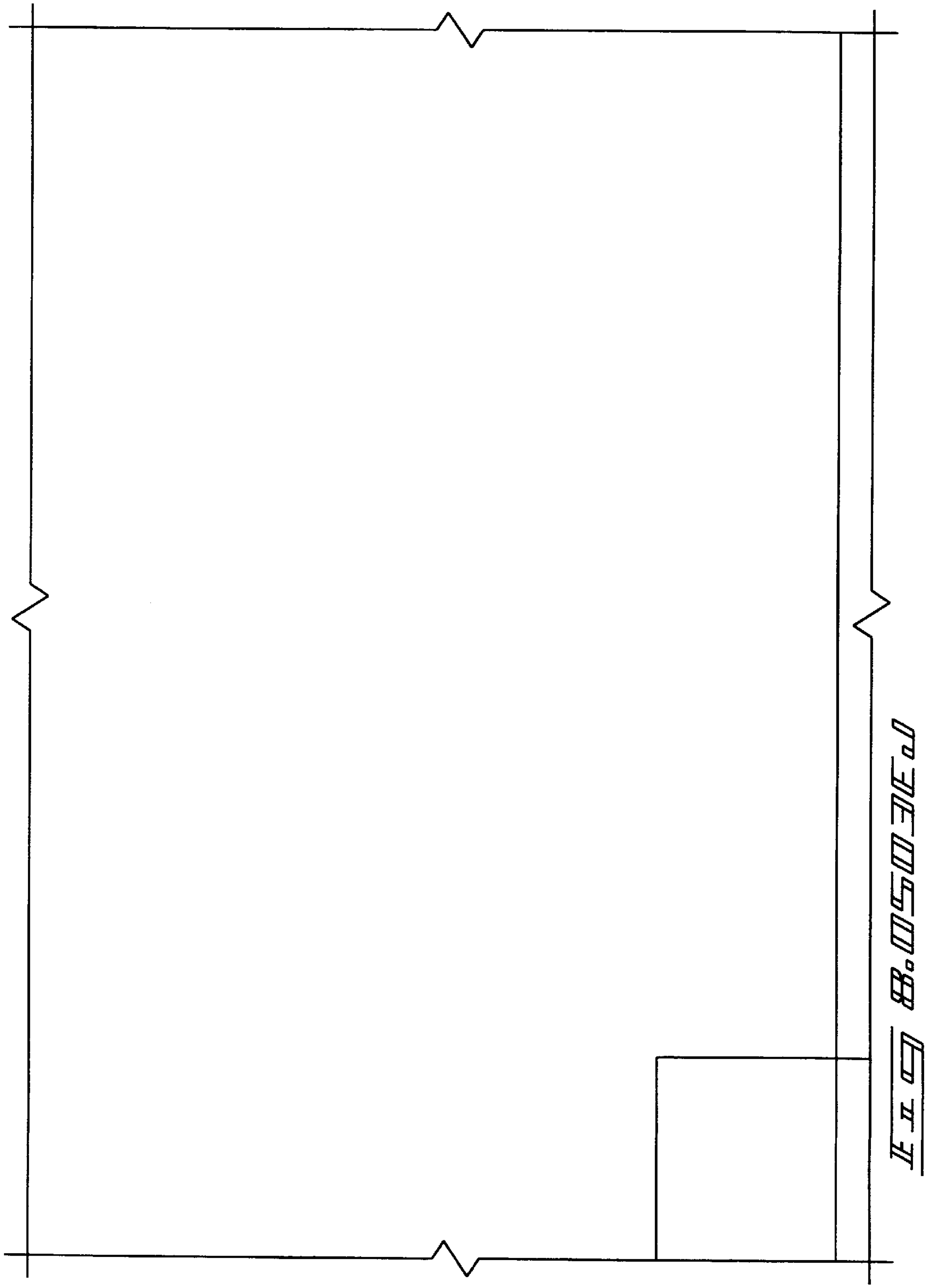
FIG. 8.050E.J

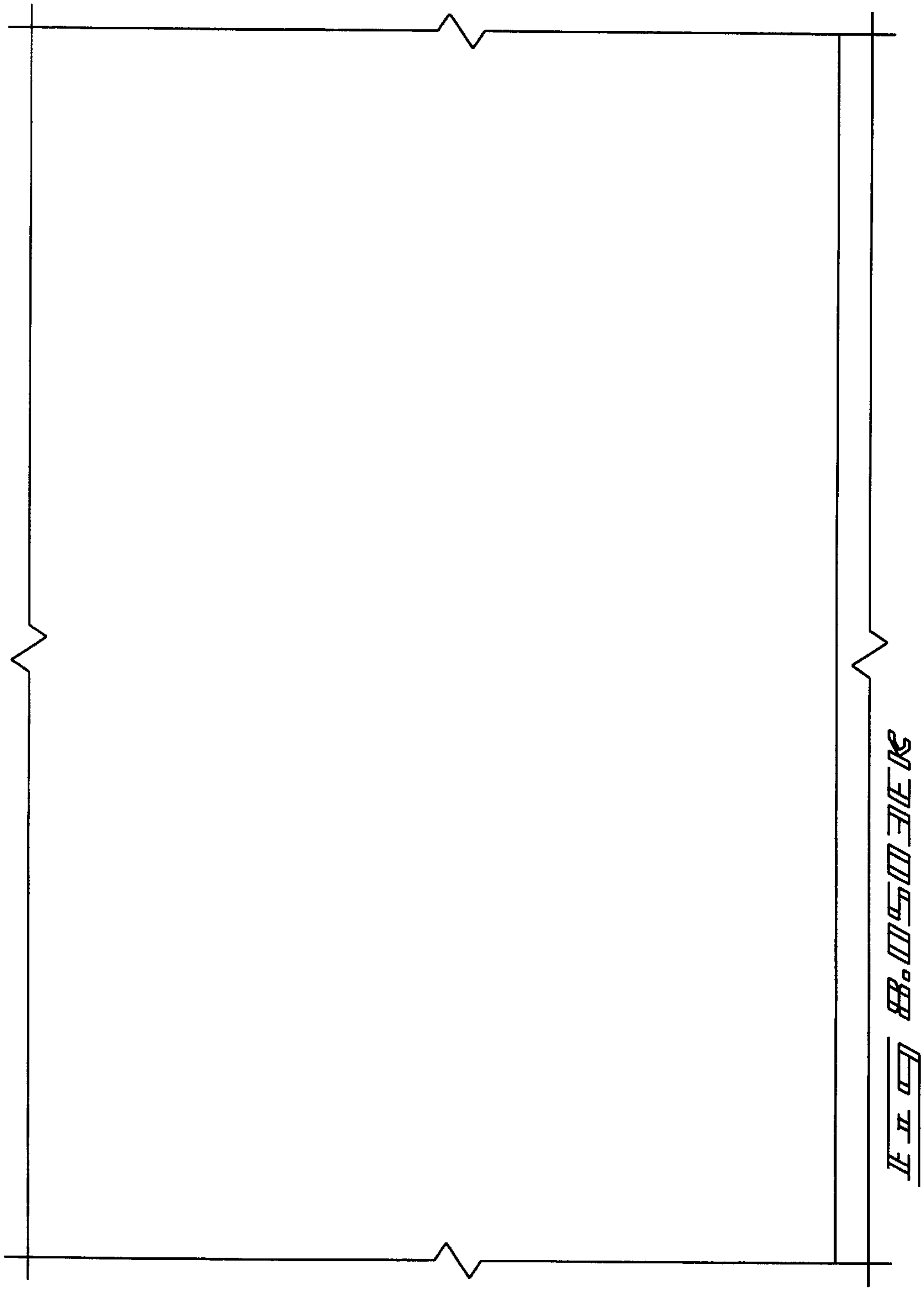
Fig. 8.0503EK

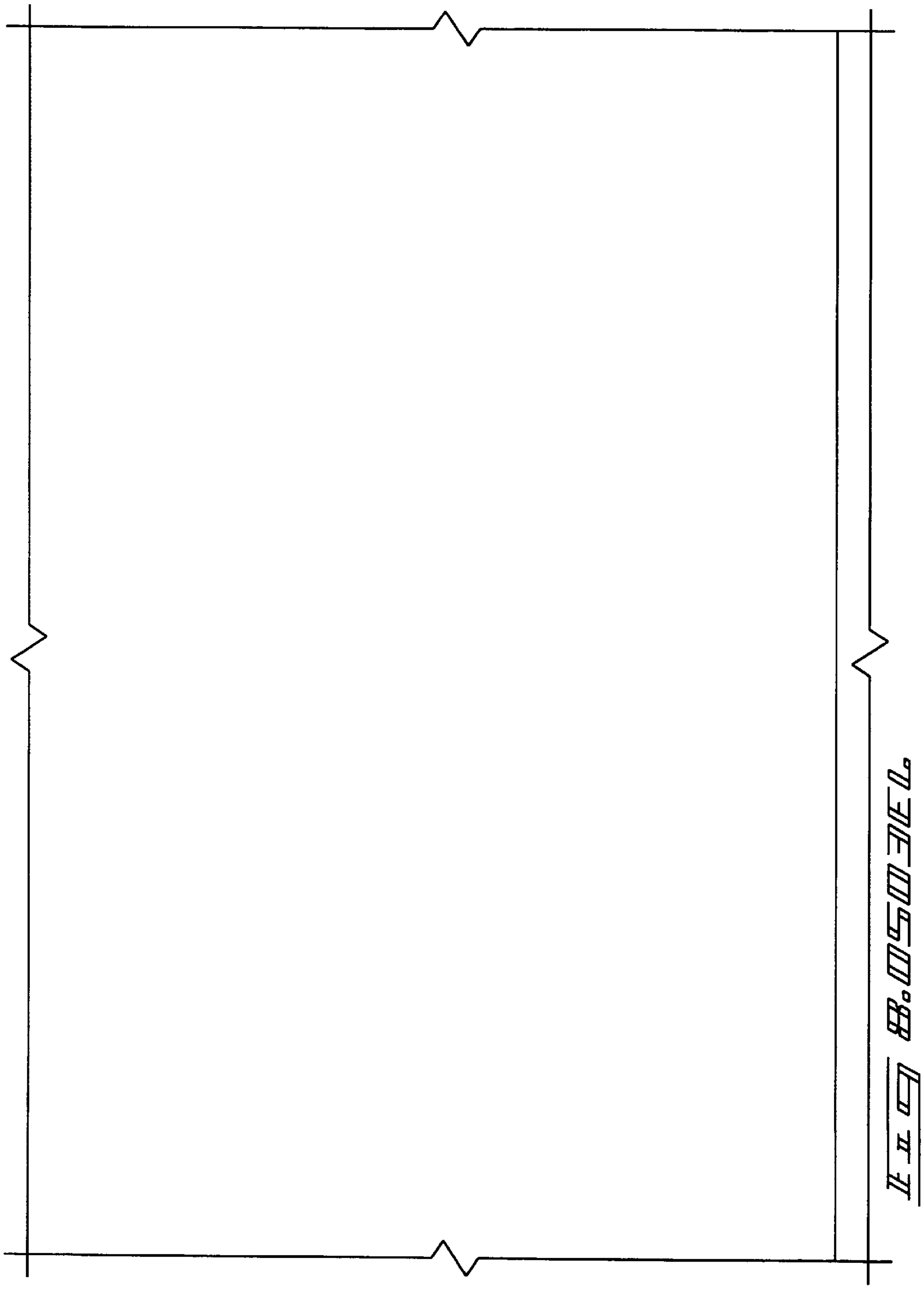
FIG. 8.0503EL

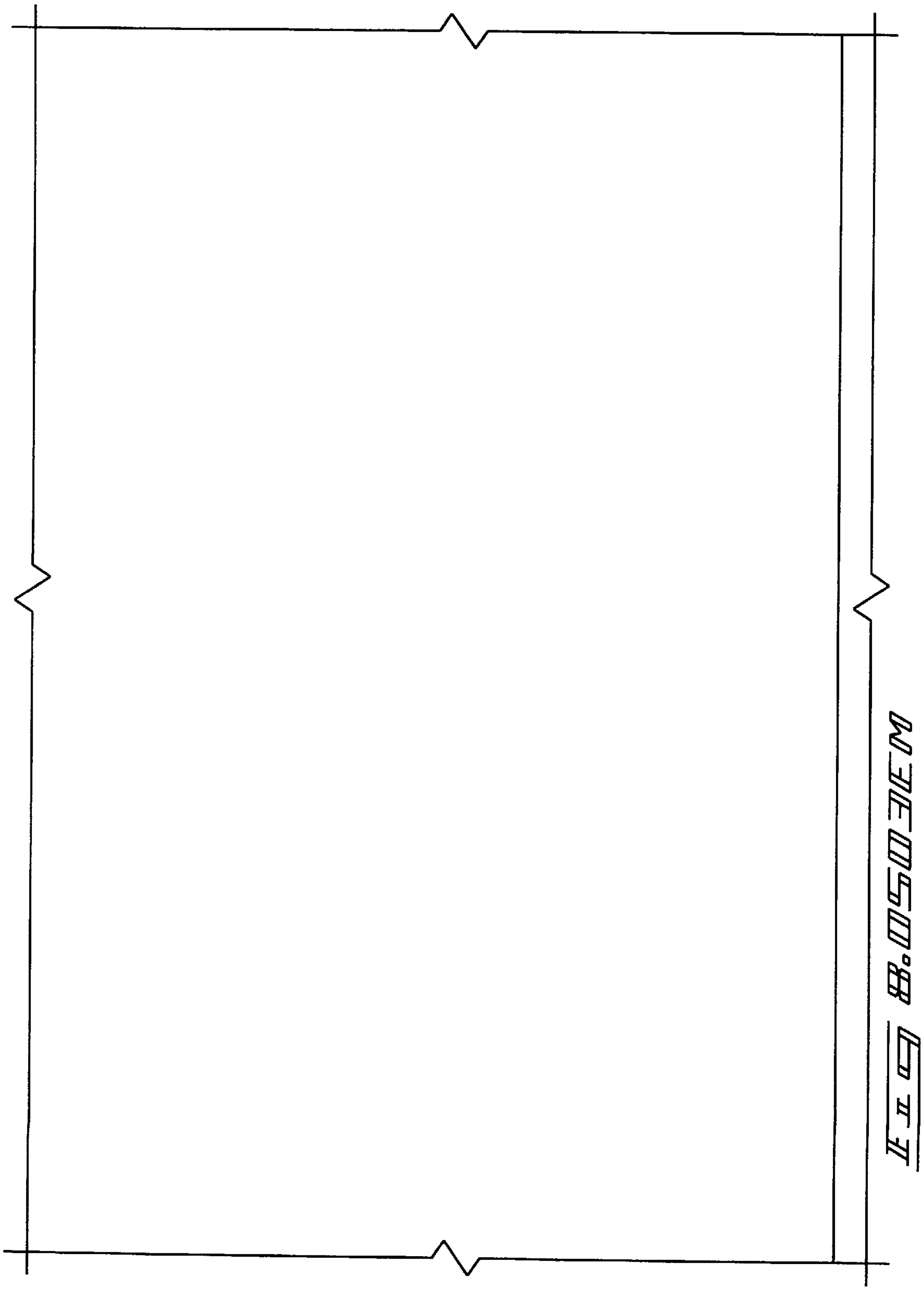
FIG. 8.0503EM

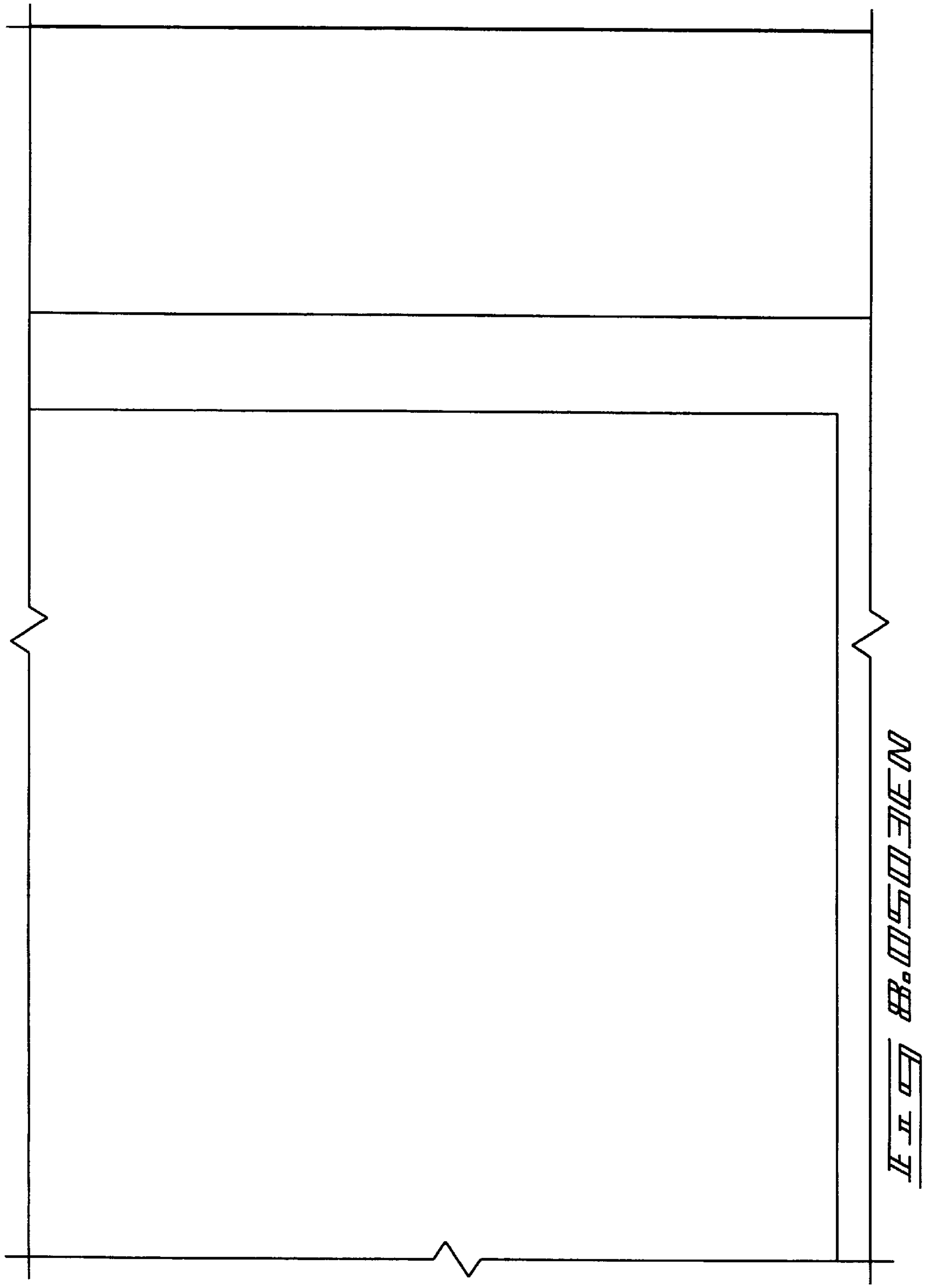
FIG. 8.0503E2

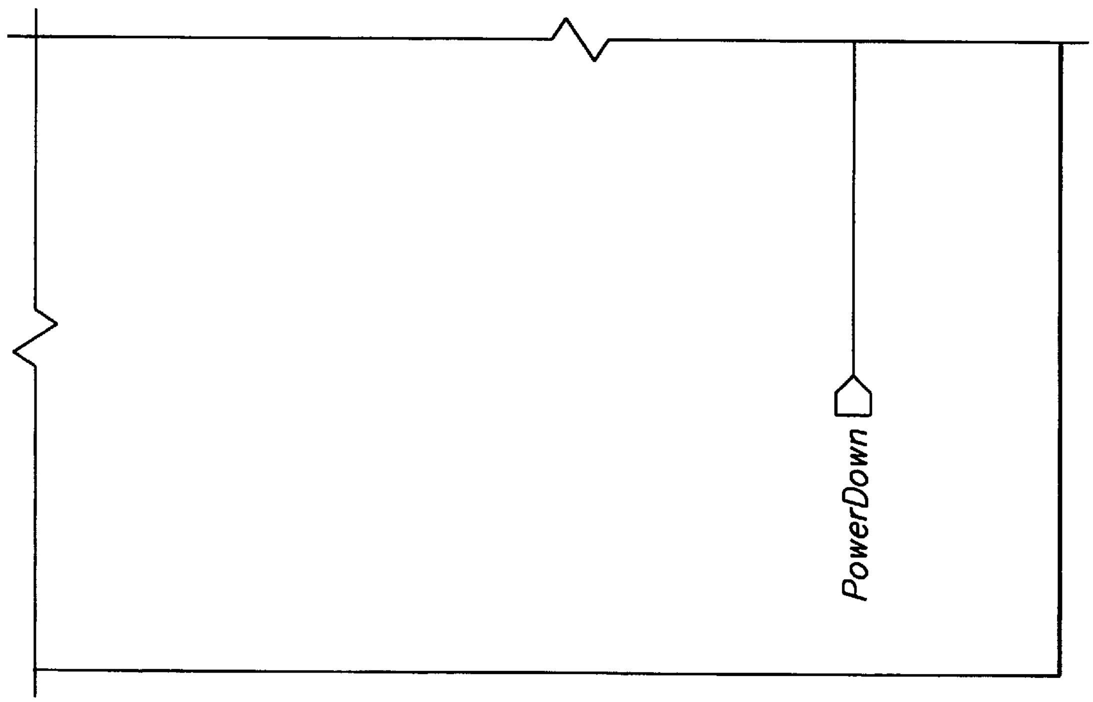
FIG. 8.0503FA

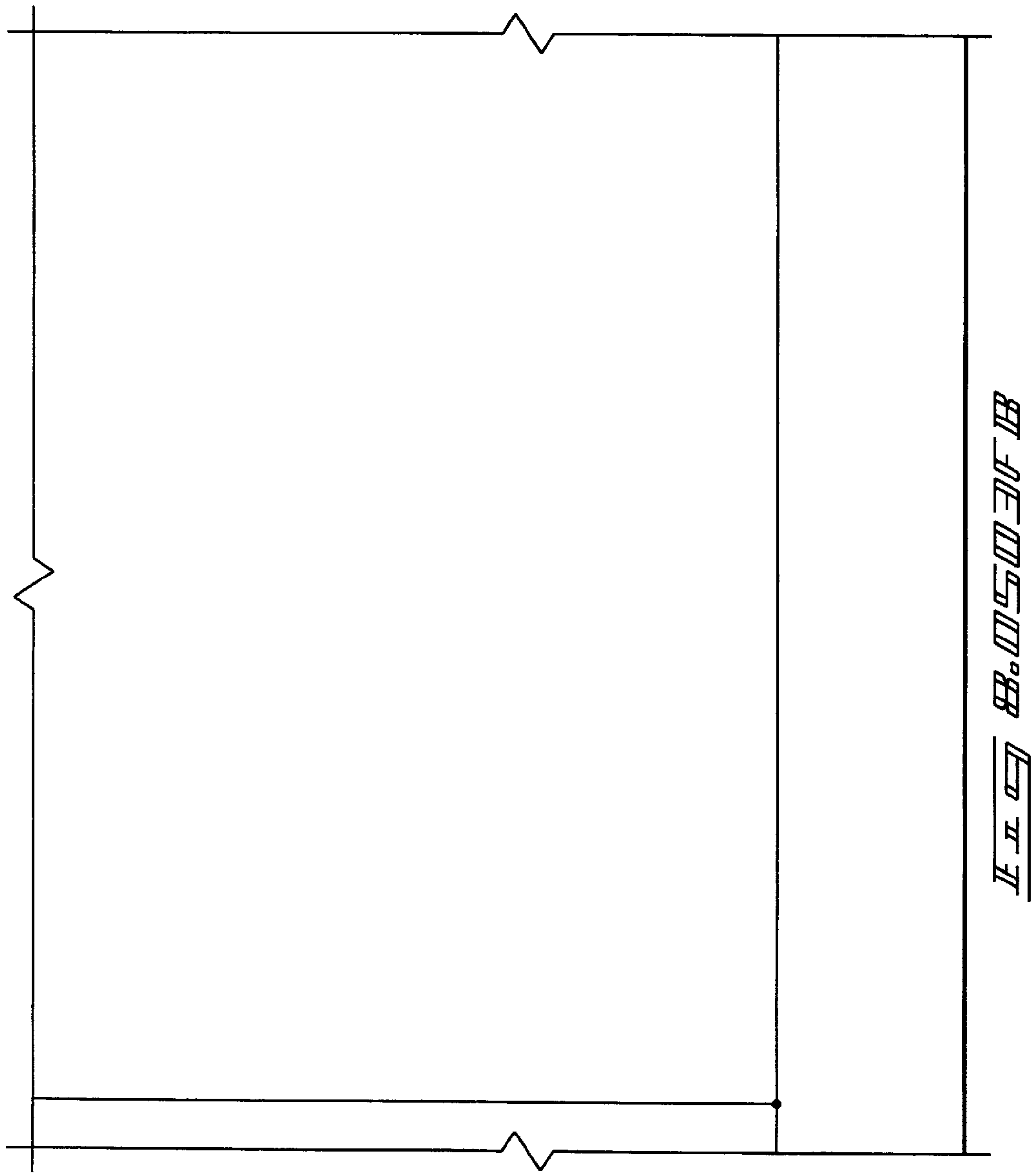
FIG. 8.050E.8

FIG. 8.0503FC

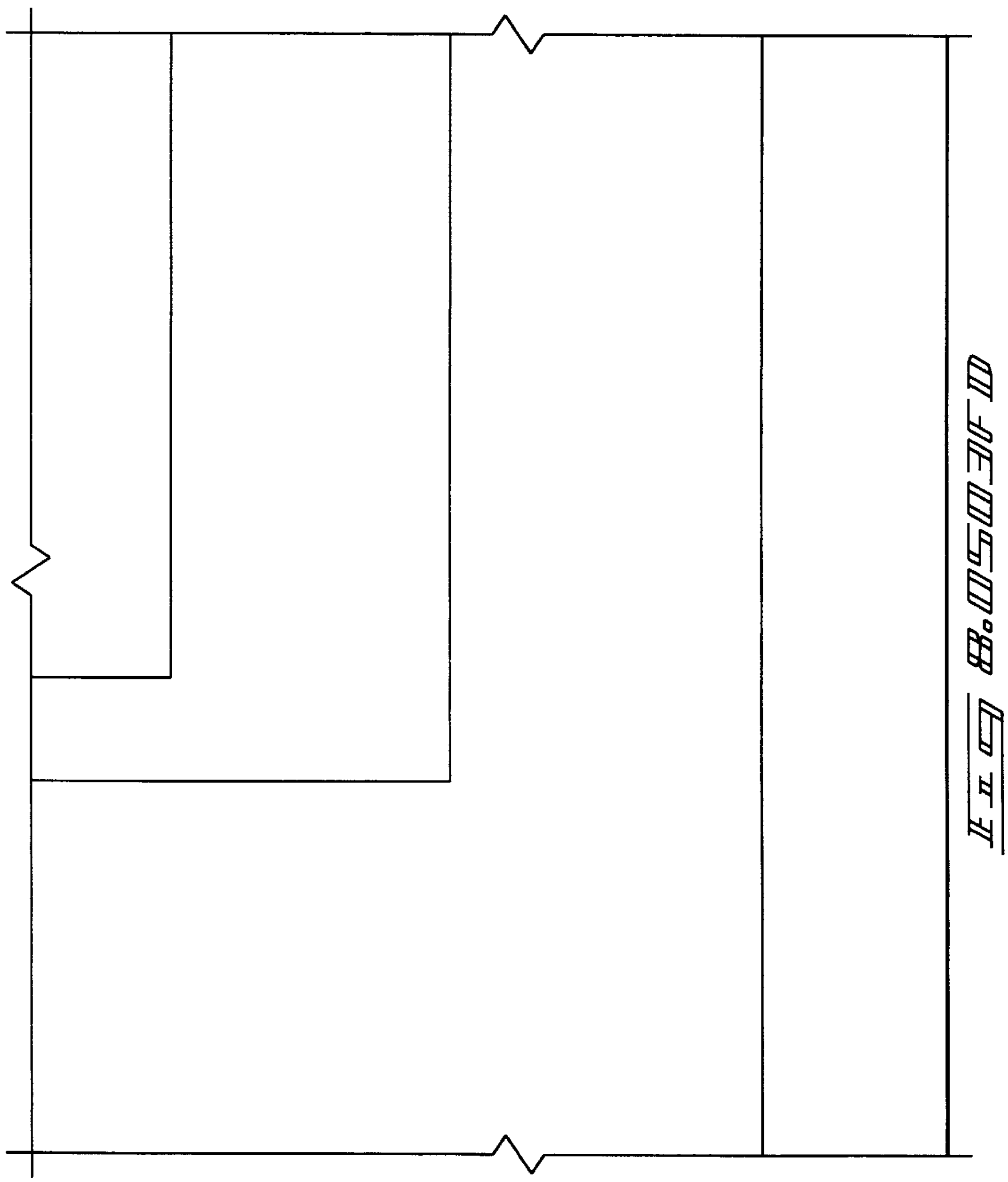
Fig 8.0503FD

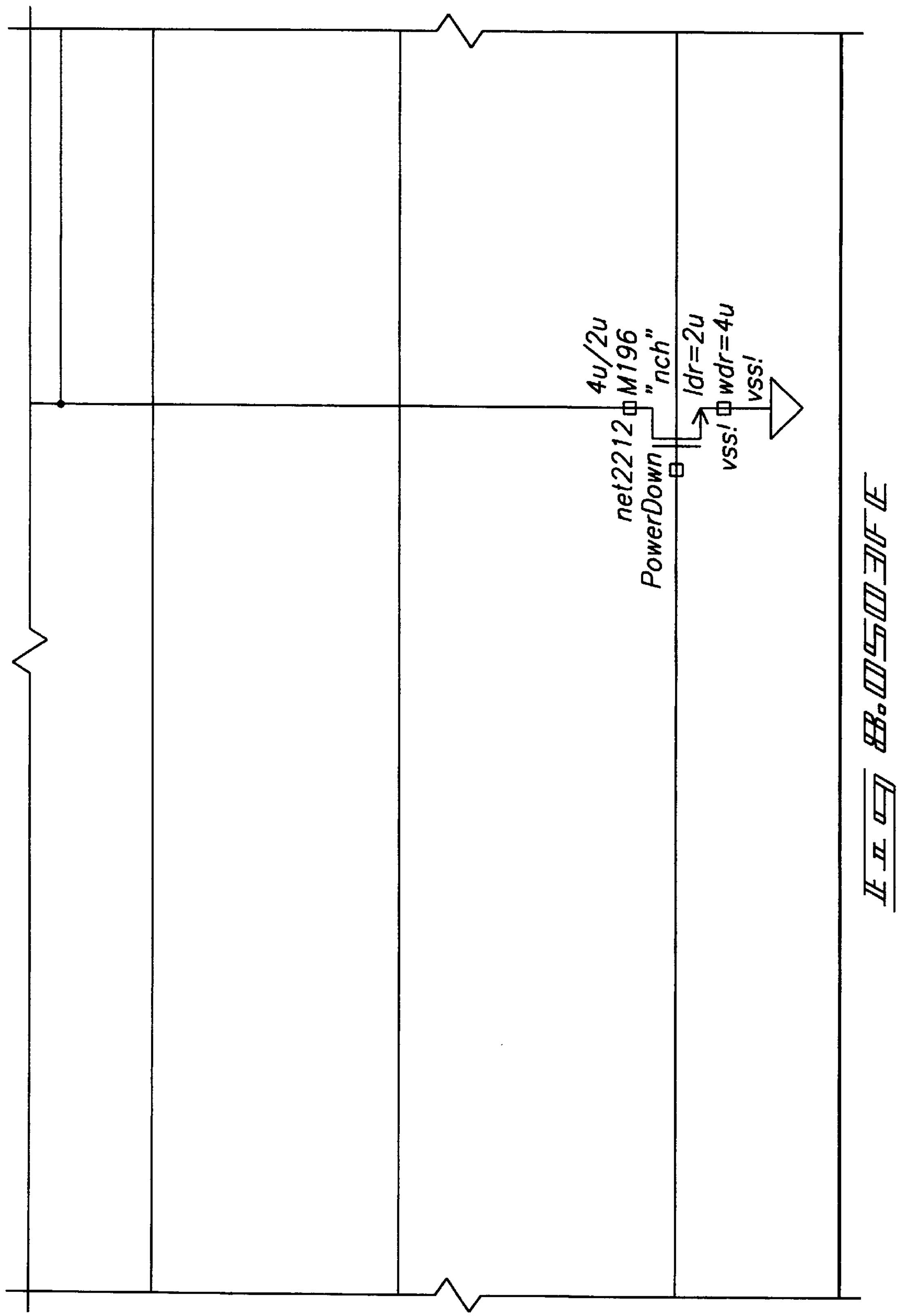
Fig. 8.0050FE

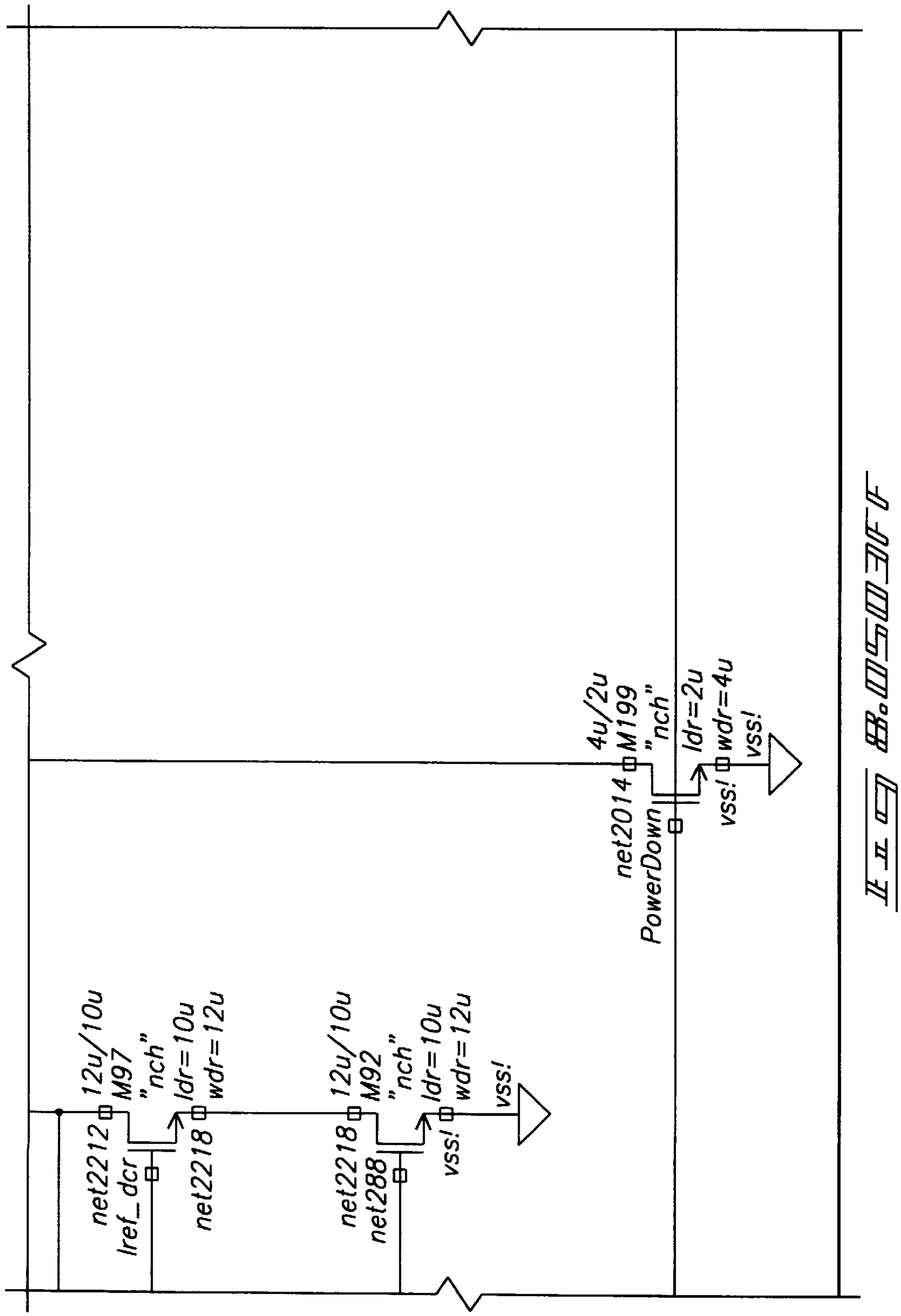
FIG. 8.050EF

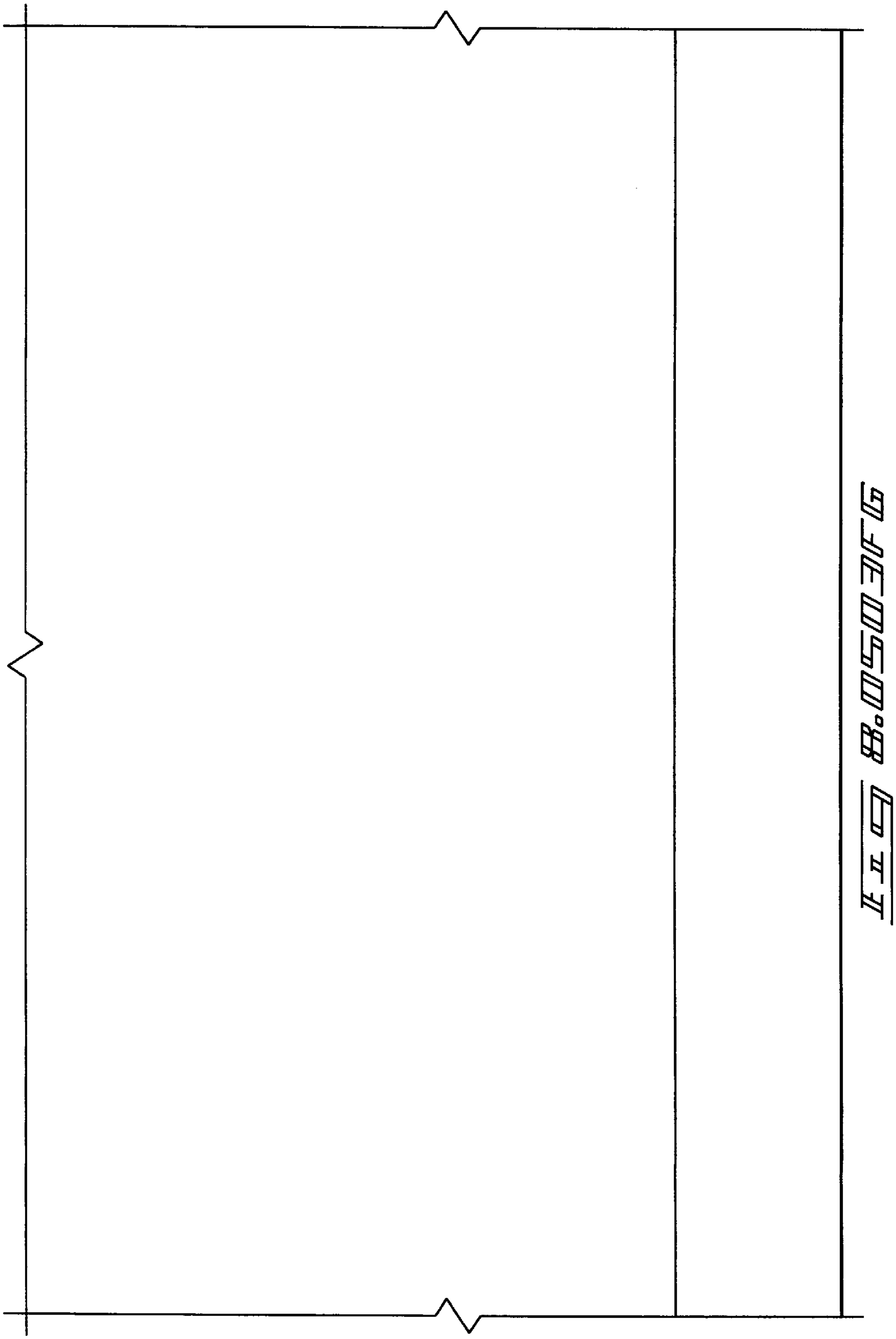
FIG. 8.0503F6

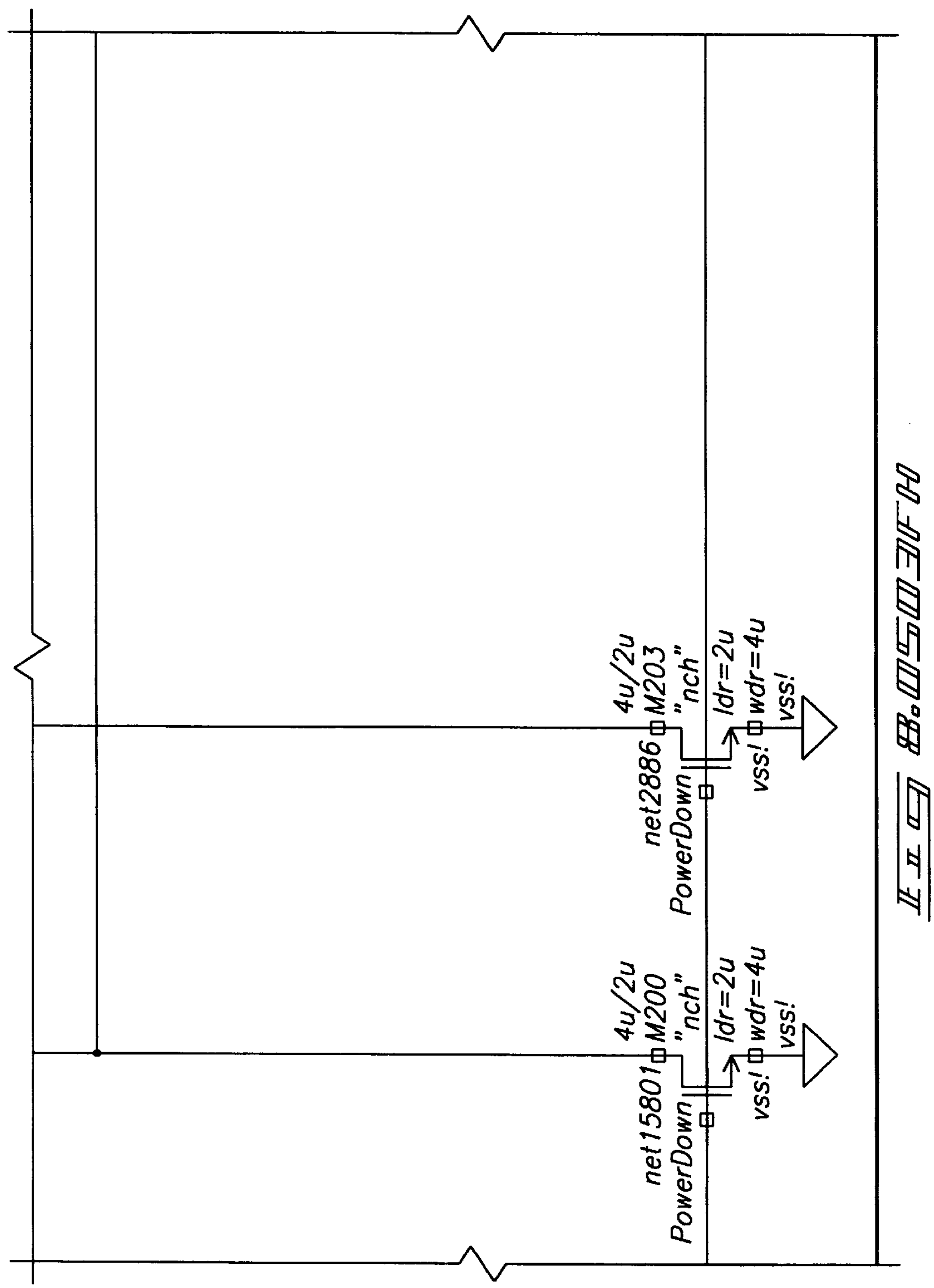
Fig. 8.0503FH

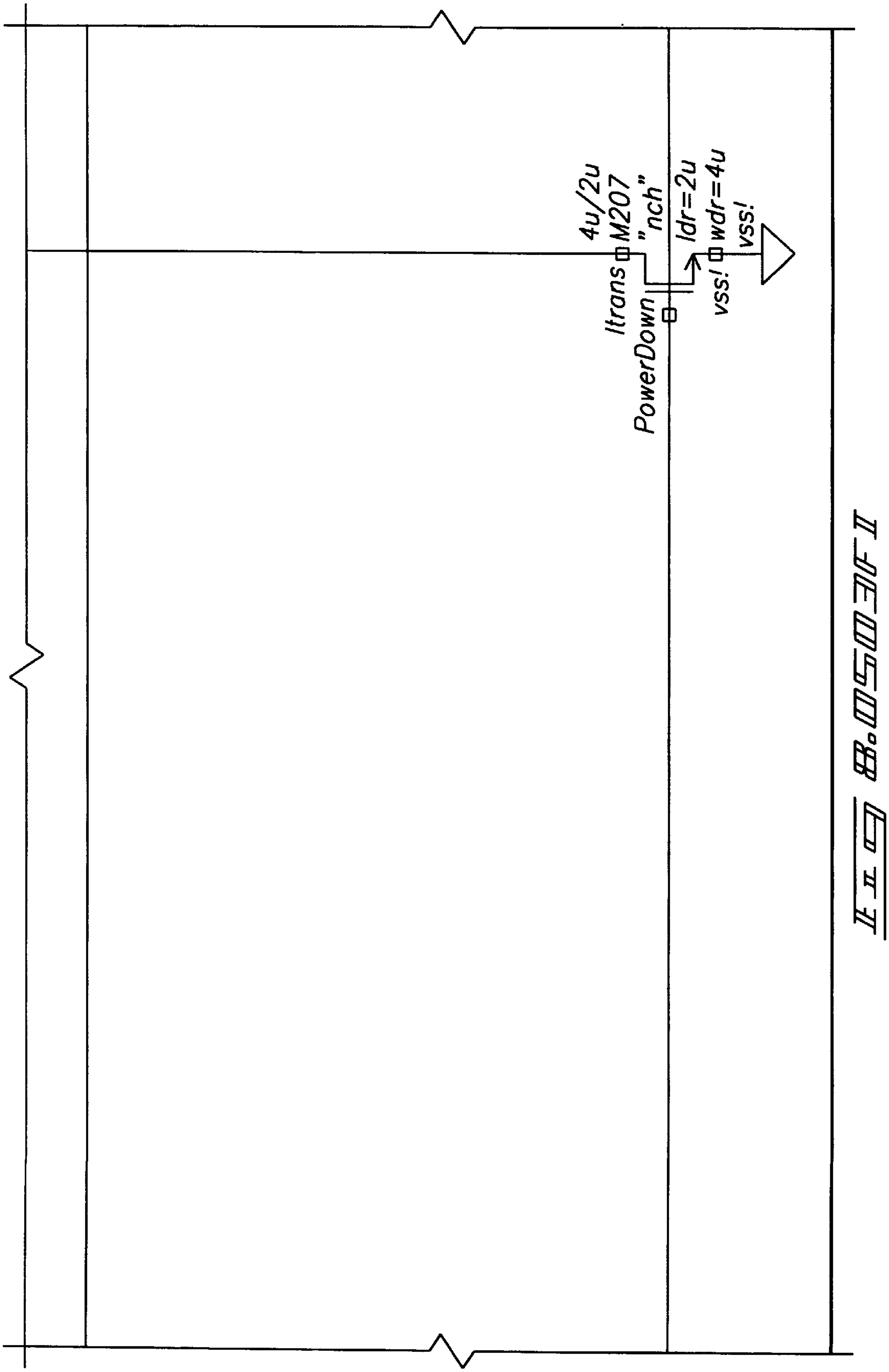
Fig 8.0503FI

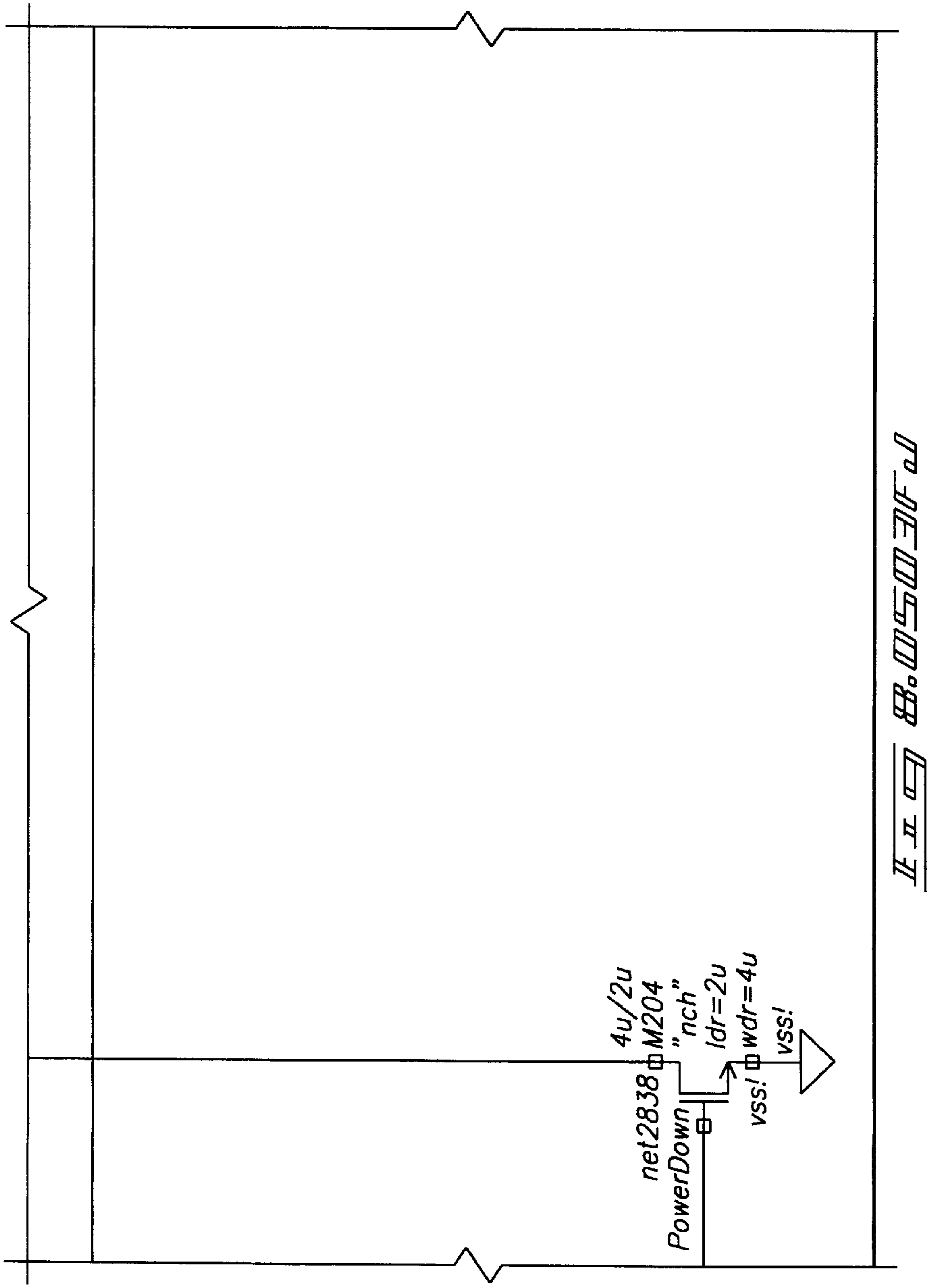
FIG. 8.0503FJ

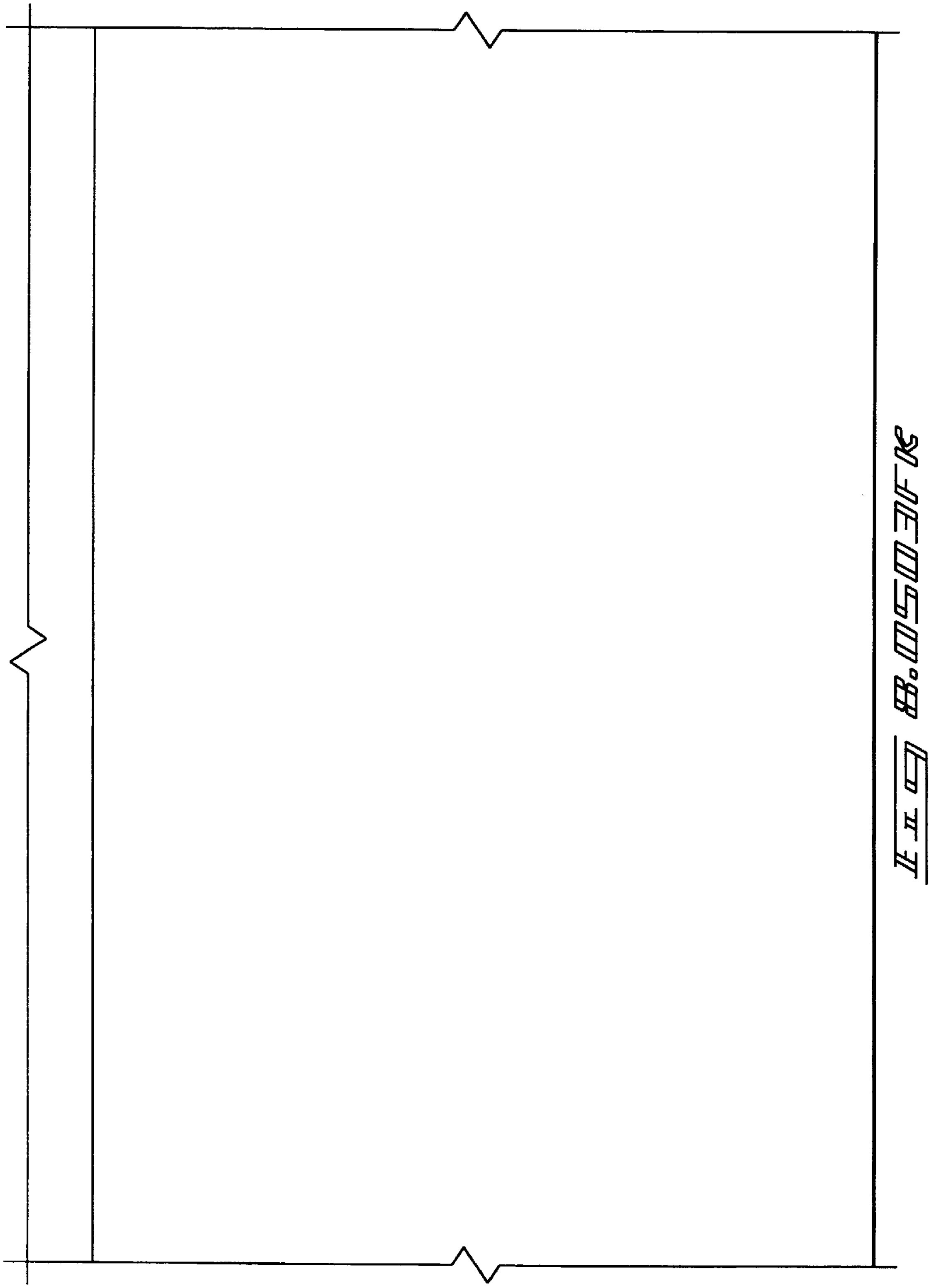
FIG. 8.0503JK

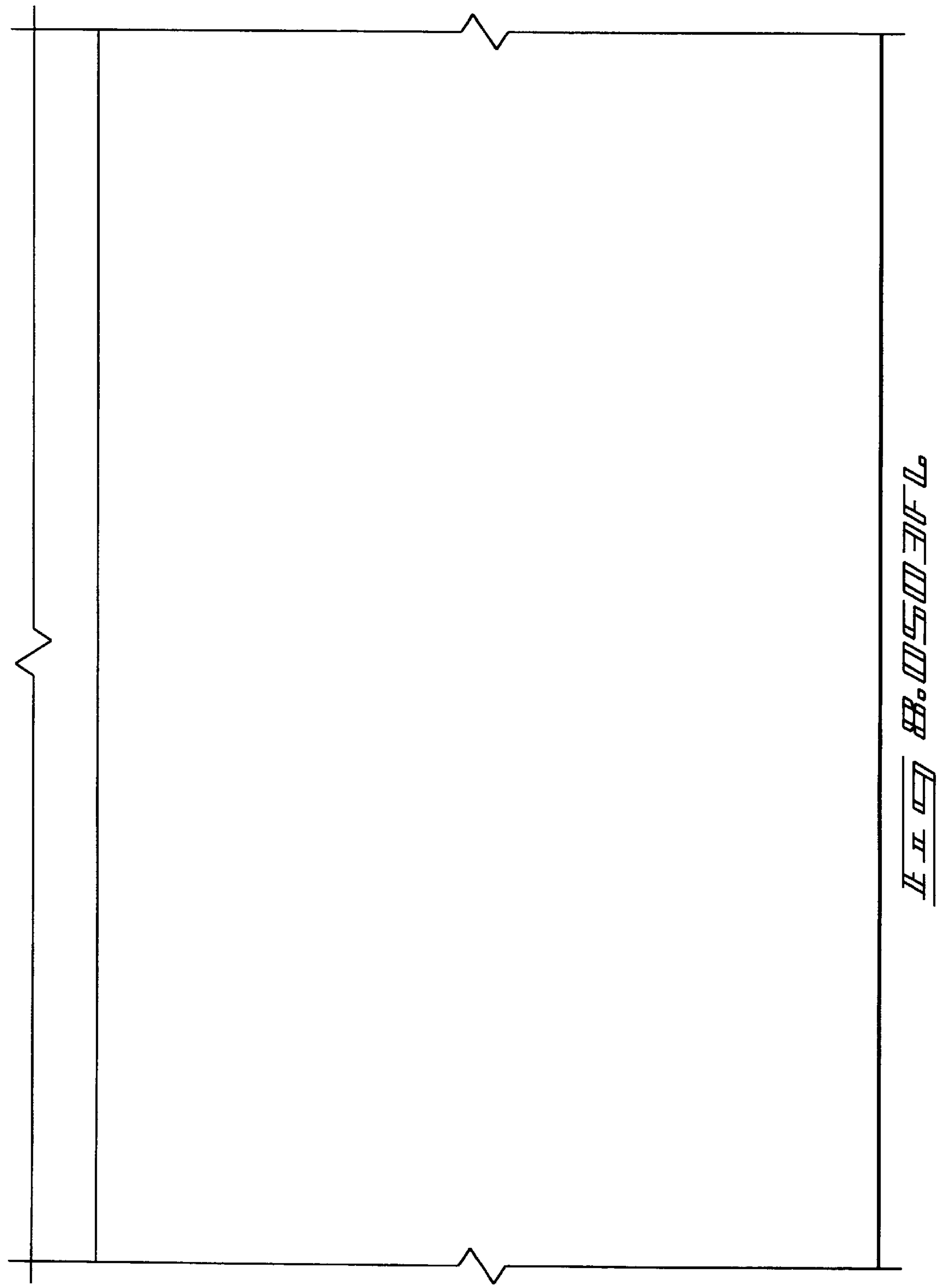
FIG. 8.0503FL

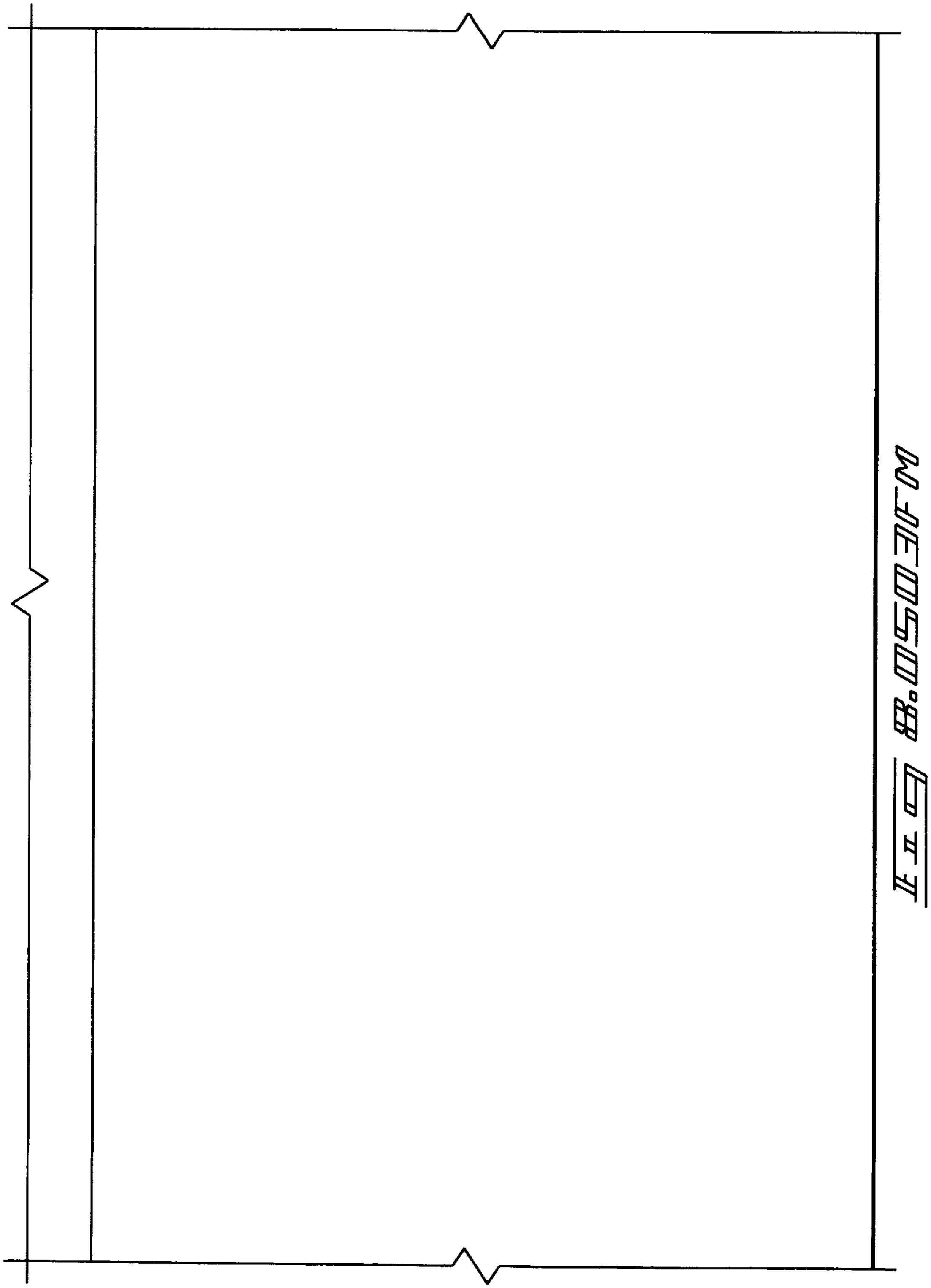
FIG. 8.050E3

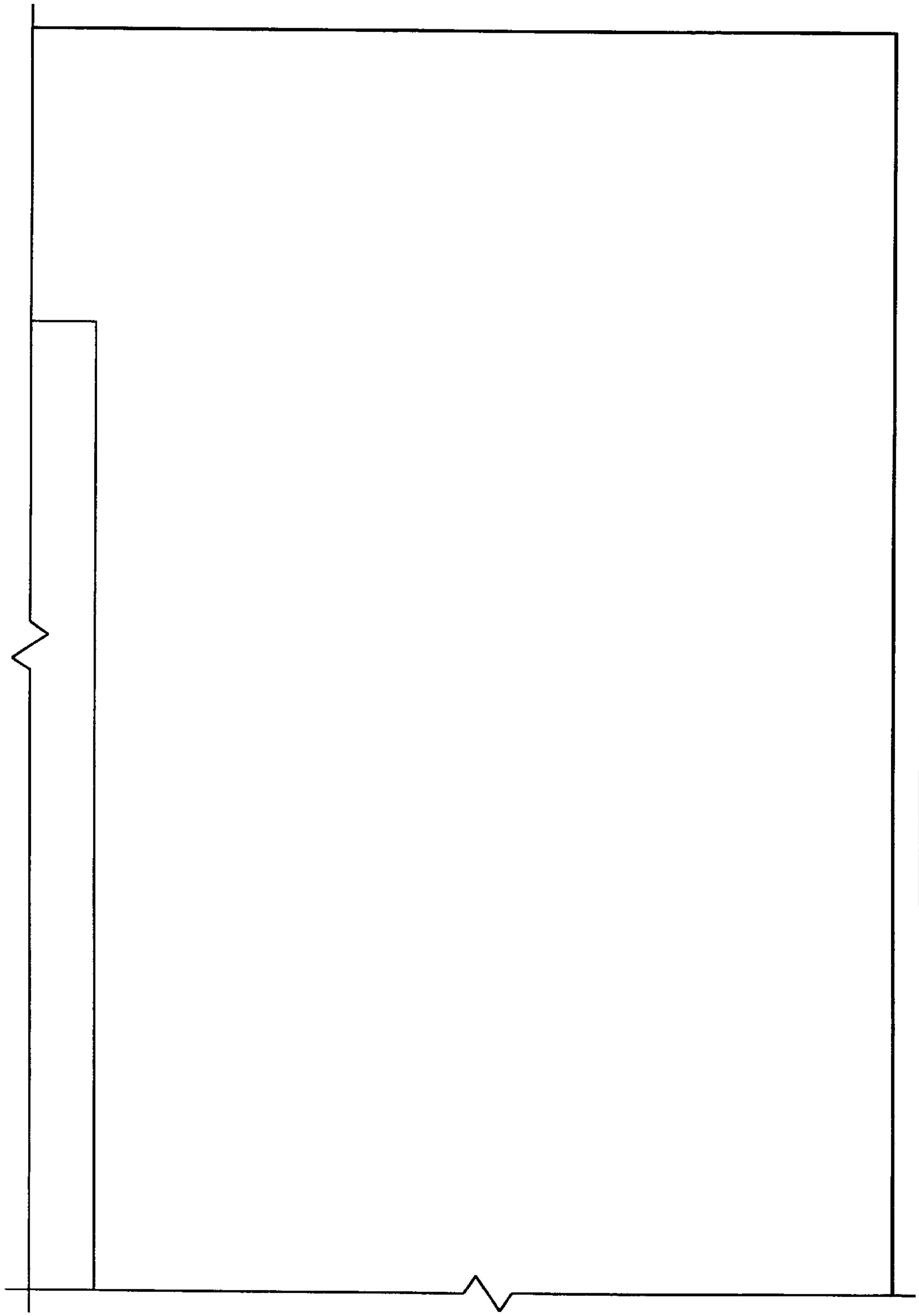
FIG. 8.050E42

| | | | | |
|---|---|---|---|---|
| 8.0504AA | 8.0504AB | 8.0504AC | 8.0504AD | |
| 8.0504BA | 8.0504BB | 8.0504BC | 8.0504BD | |
| 8.0504CA | 8.0504CB | 8.0504CC | 8.0504CD | 8.0504CE |
| 8.0504DA | 8.0504DB | 8.0504DC | 8.0504DD | 8.0504DE |
| 8.0504EA | 8.0504EB | 8.0504EC | 8.0504ED | 8.0504EE |

Fig. 8.0504

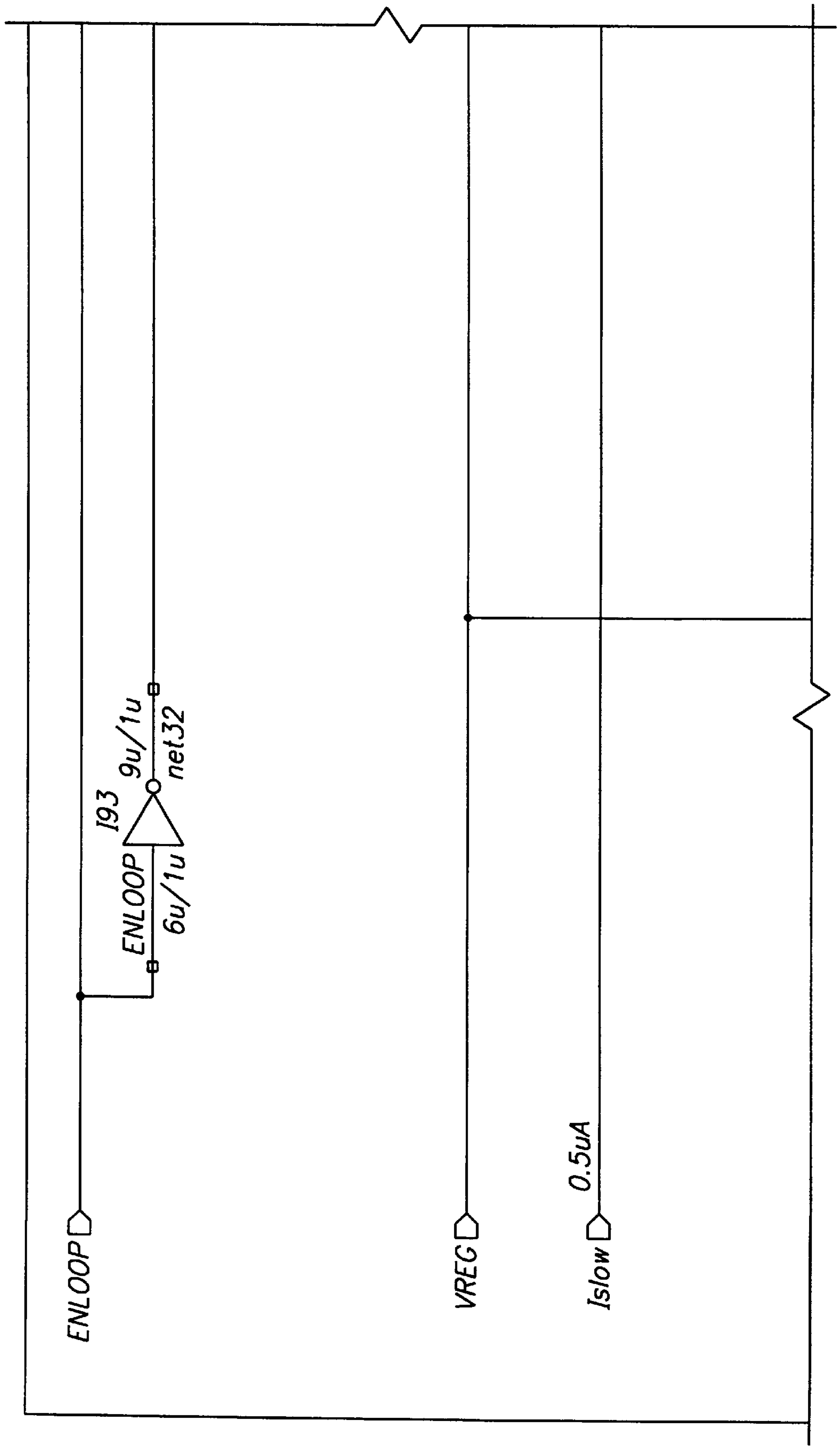
Fig. 8.050.4AA

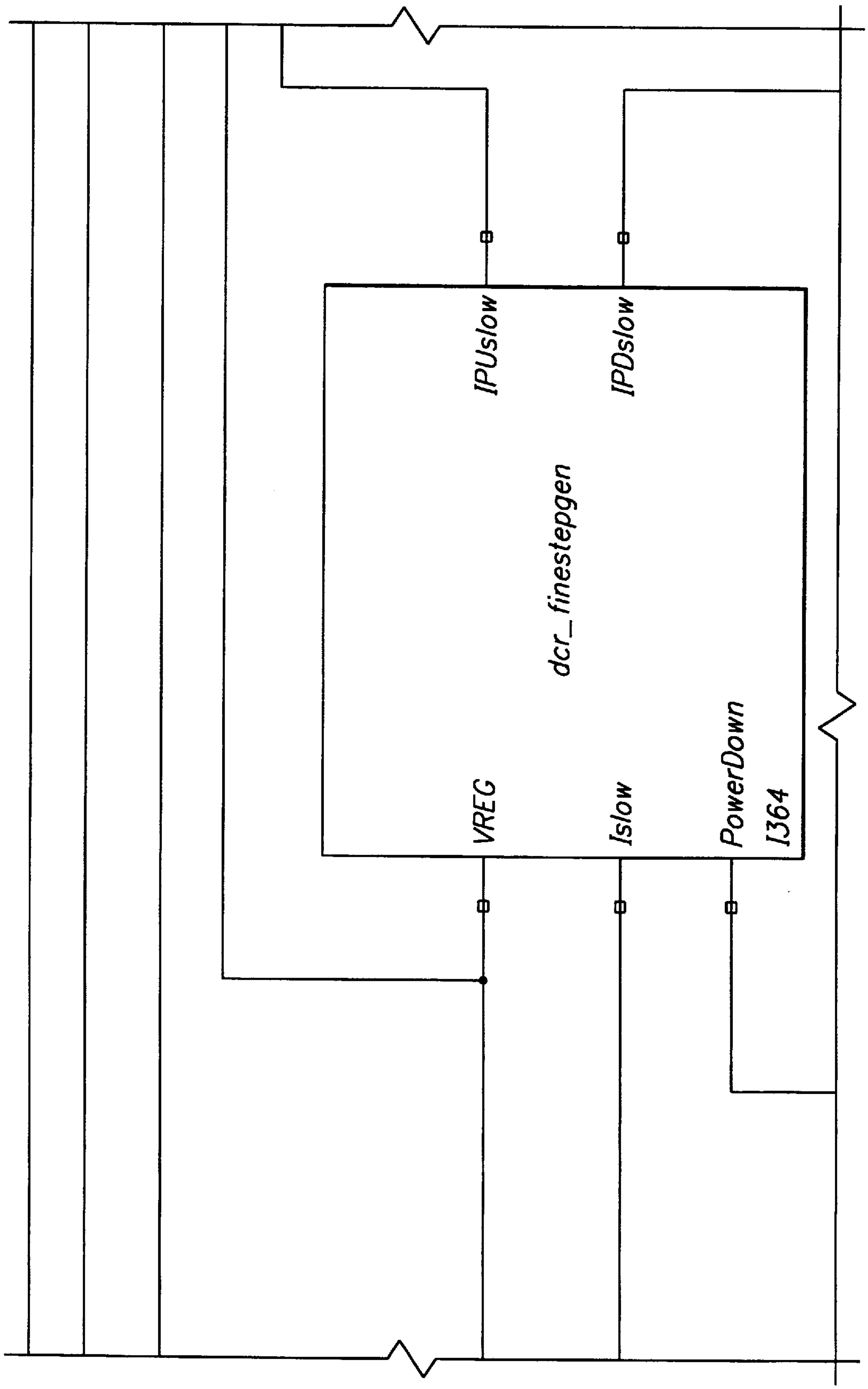
FIG. 8.0504AB

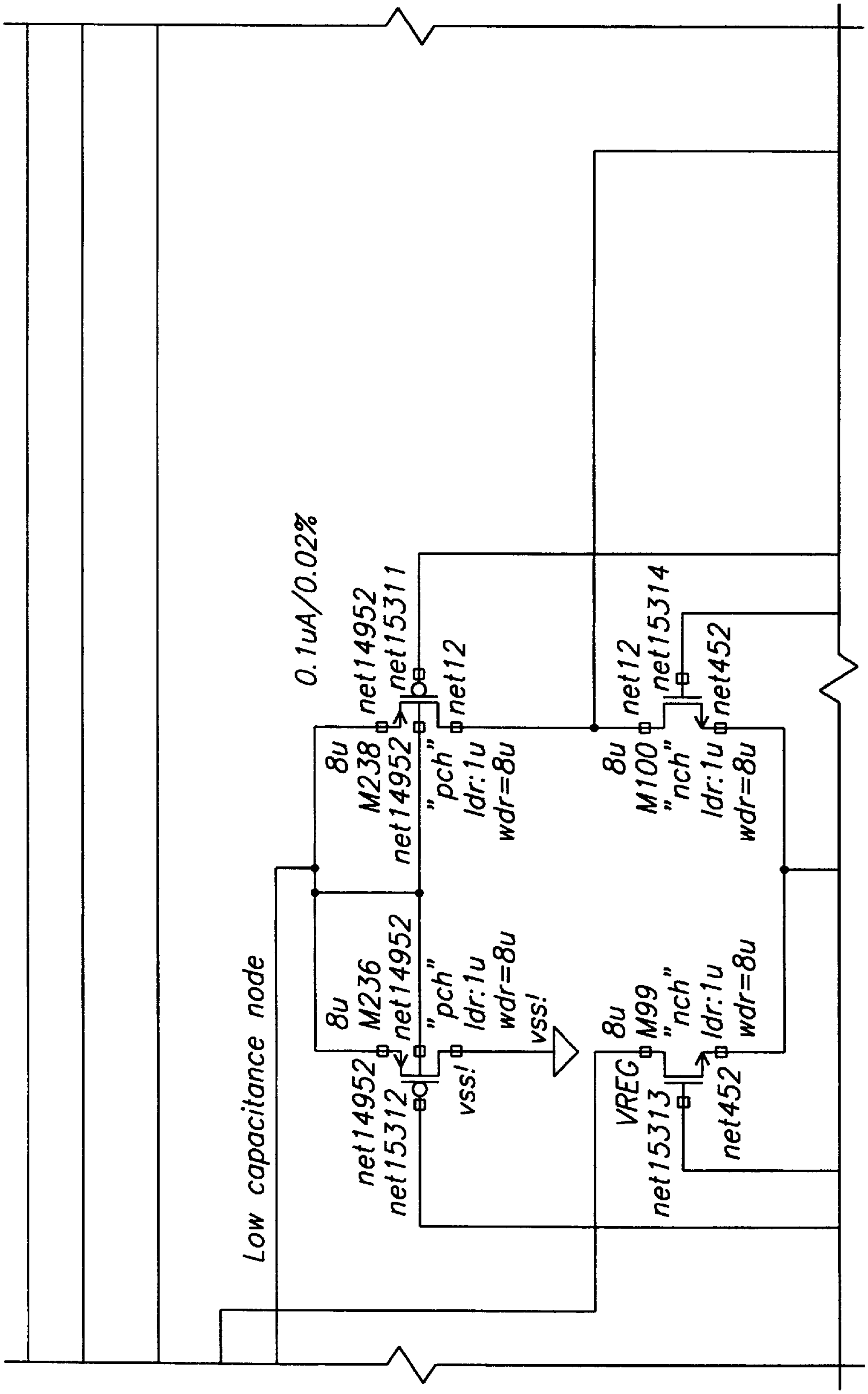
FIG 8.050.4AC

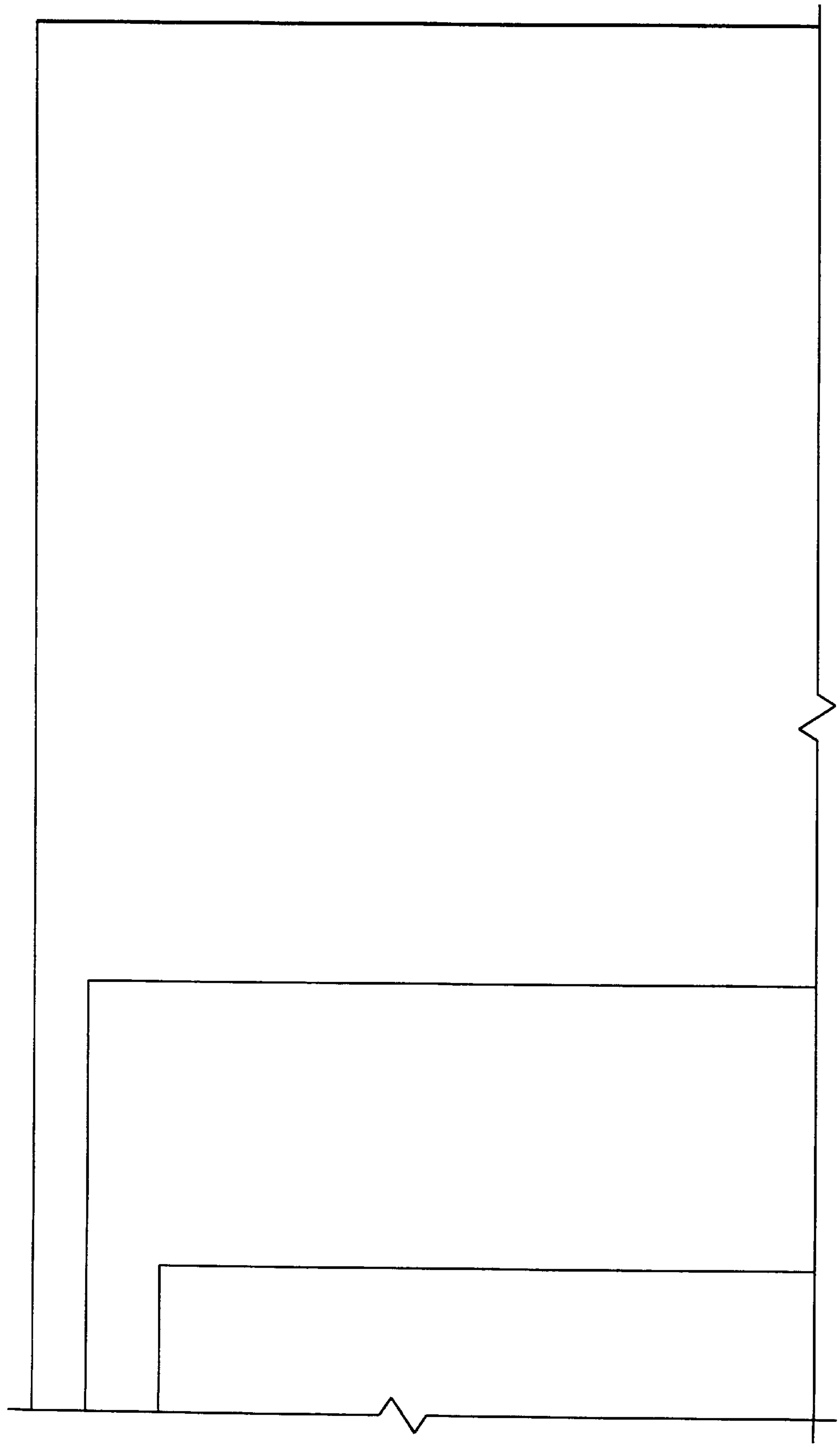
Fig 8.0504AD

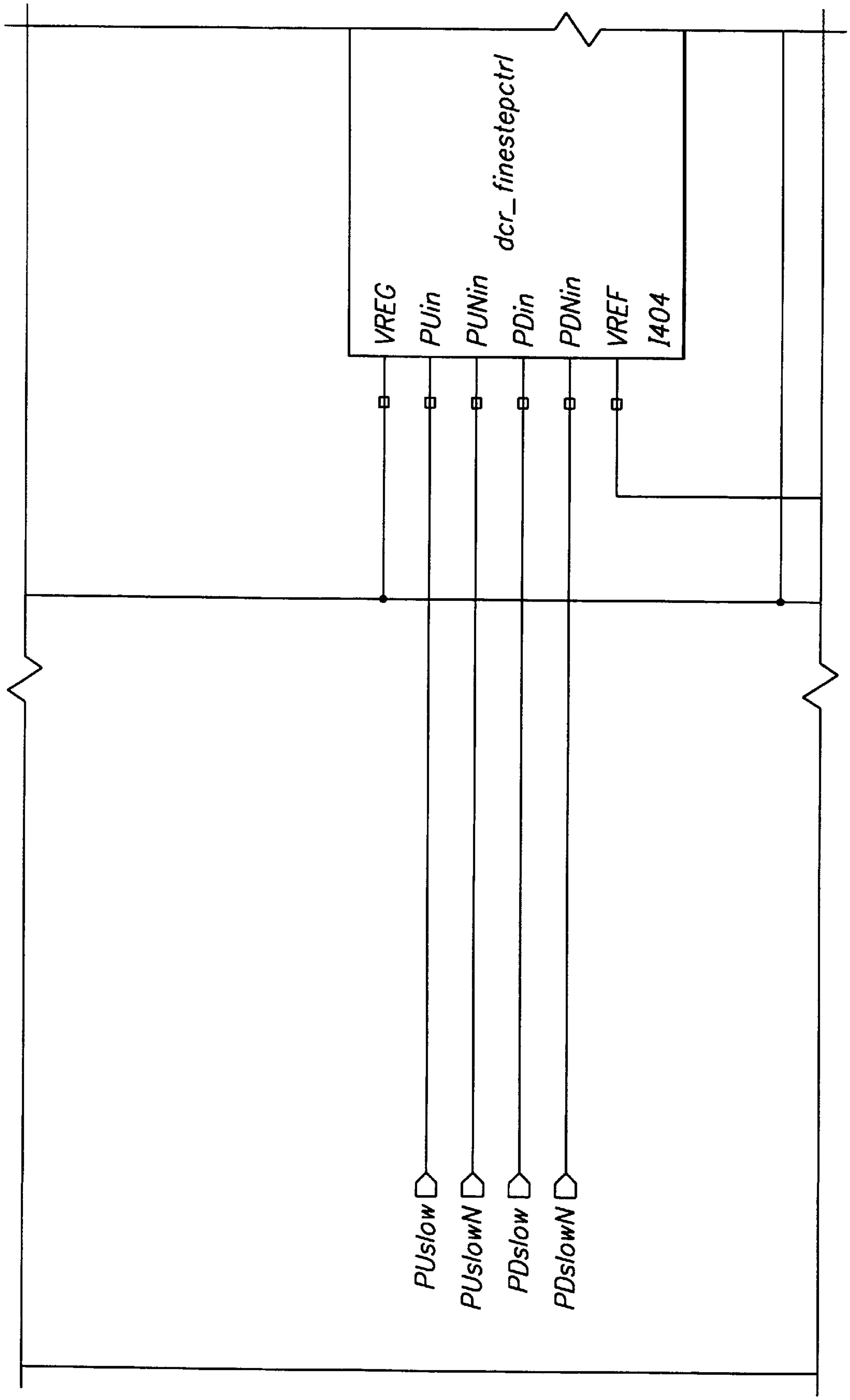
FIG. 8.050.7BA

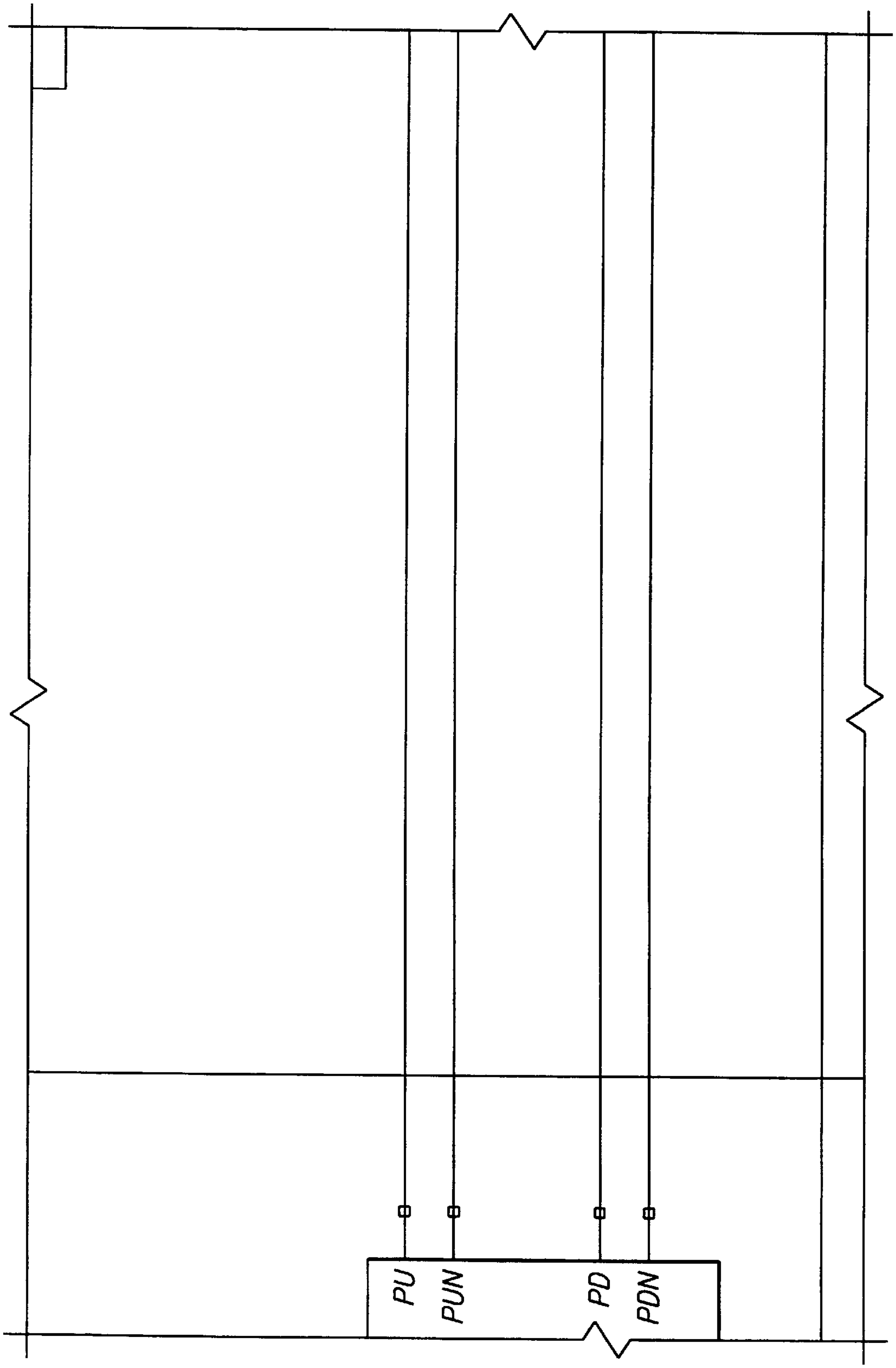
FIG. 8.050.4BB

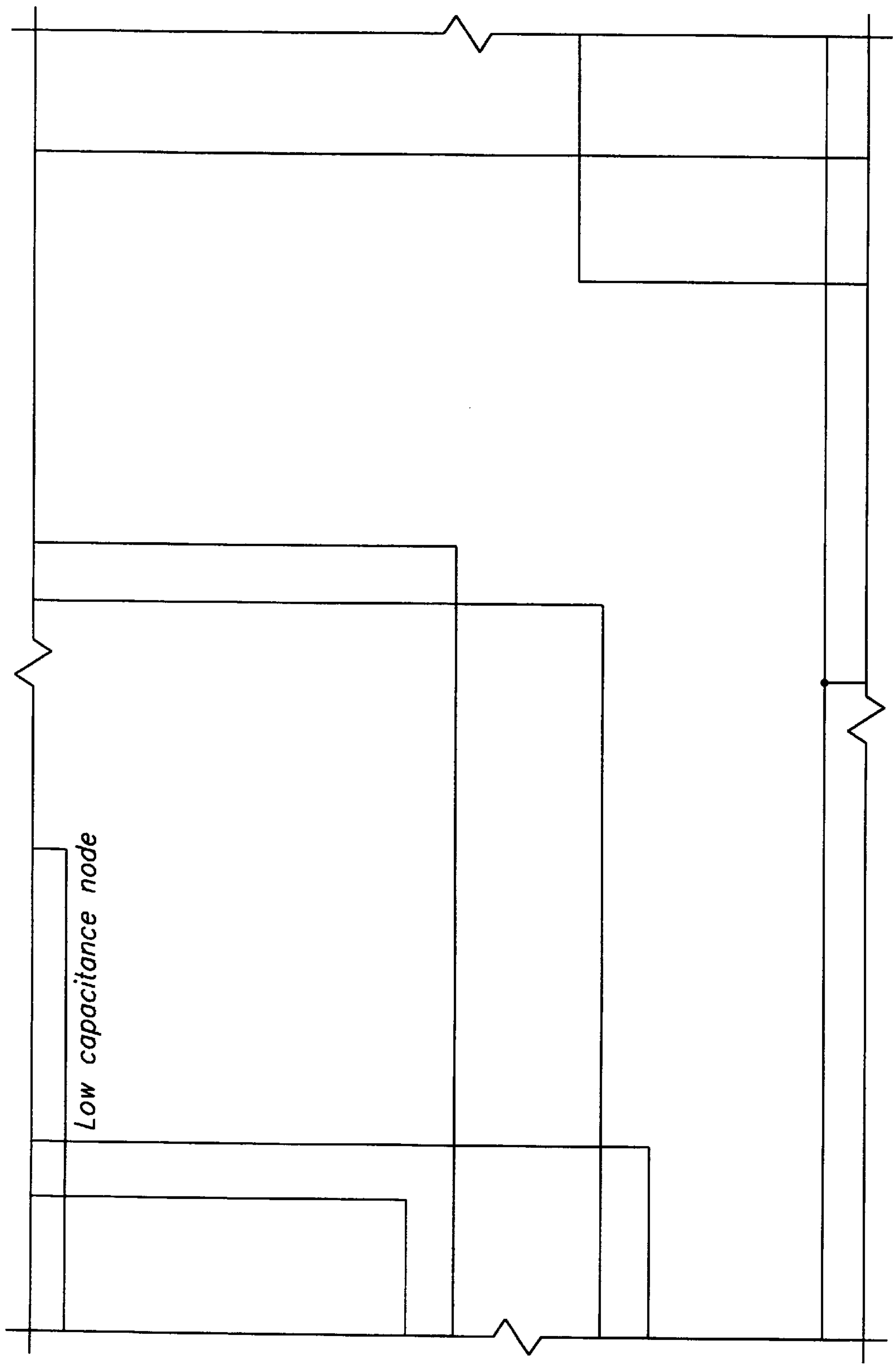
FIG. 8.0504BC

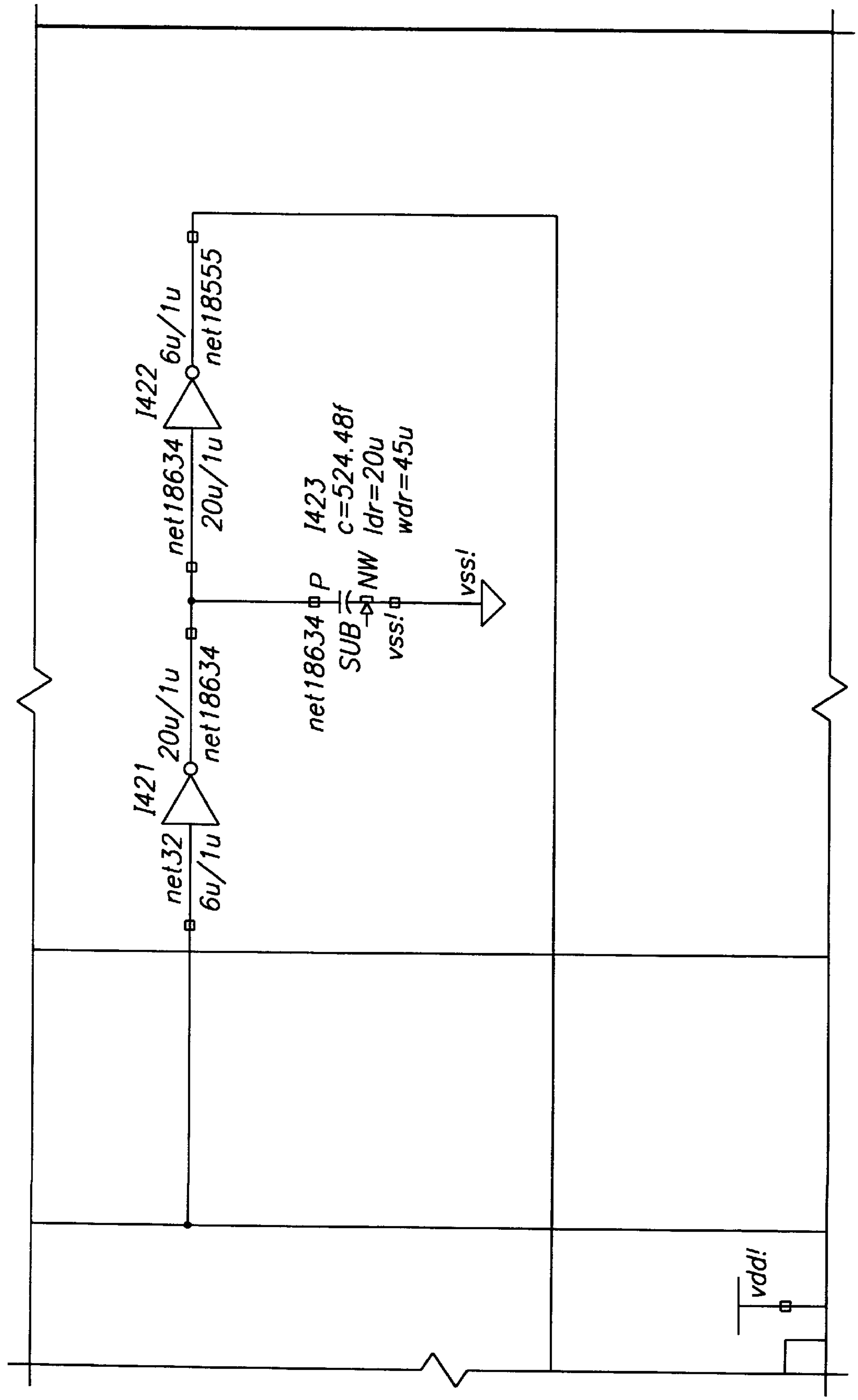
Fig 8.050.4BD

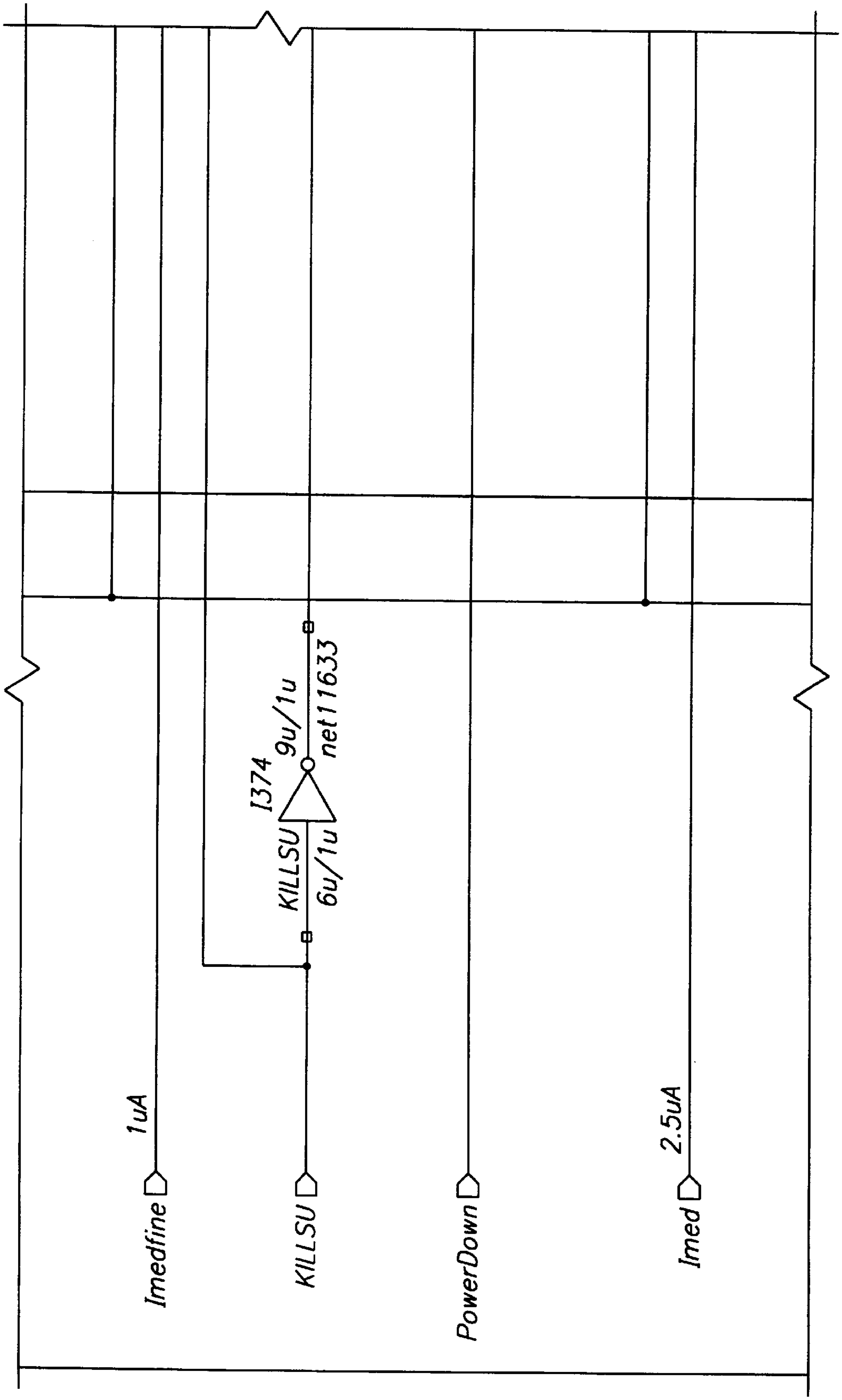
FIG. 8.0504CA

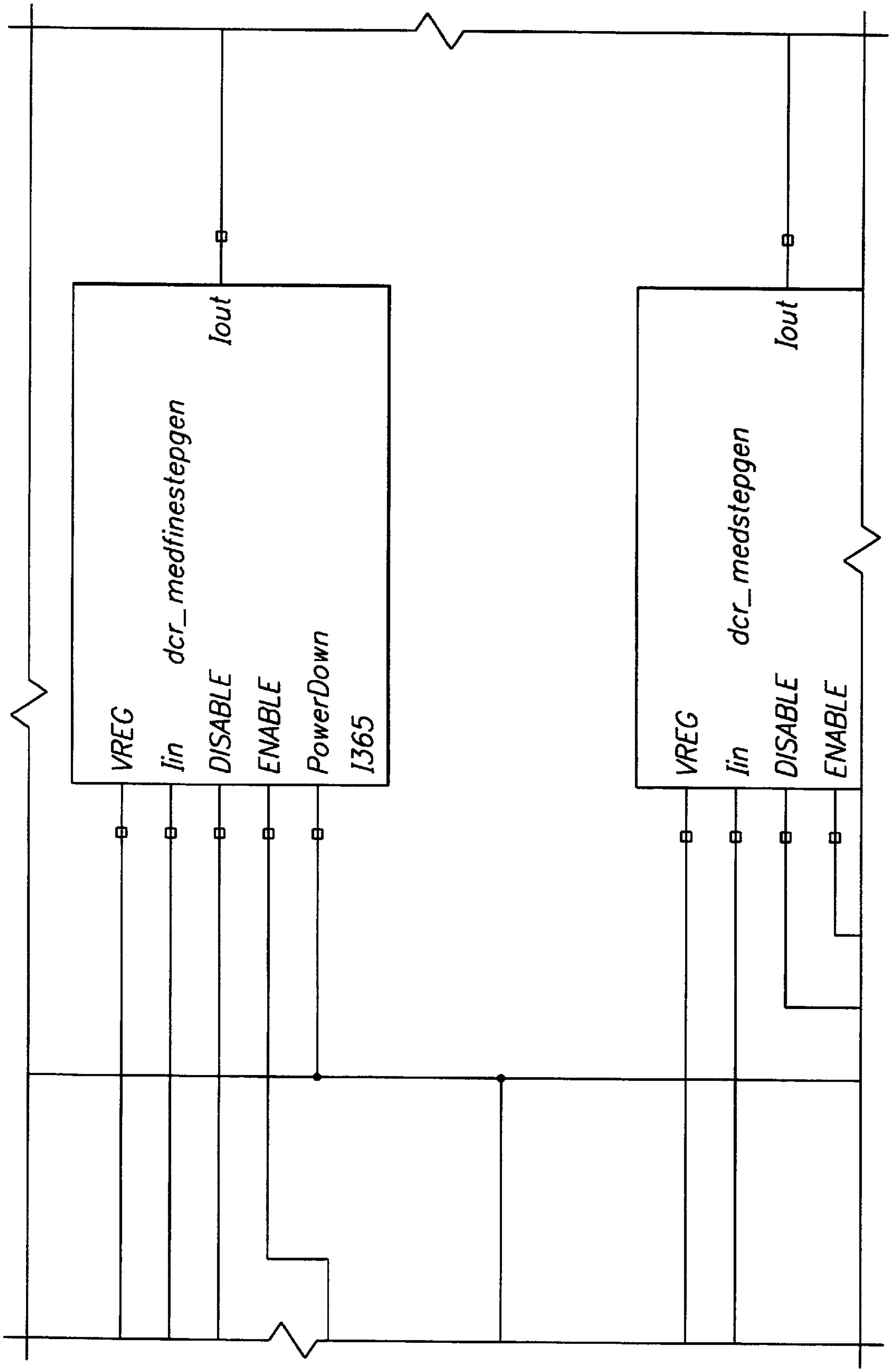
FIG. 8.050.4CB

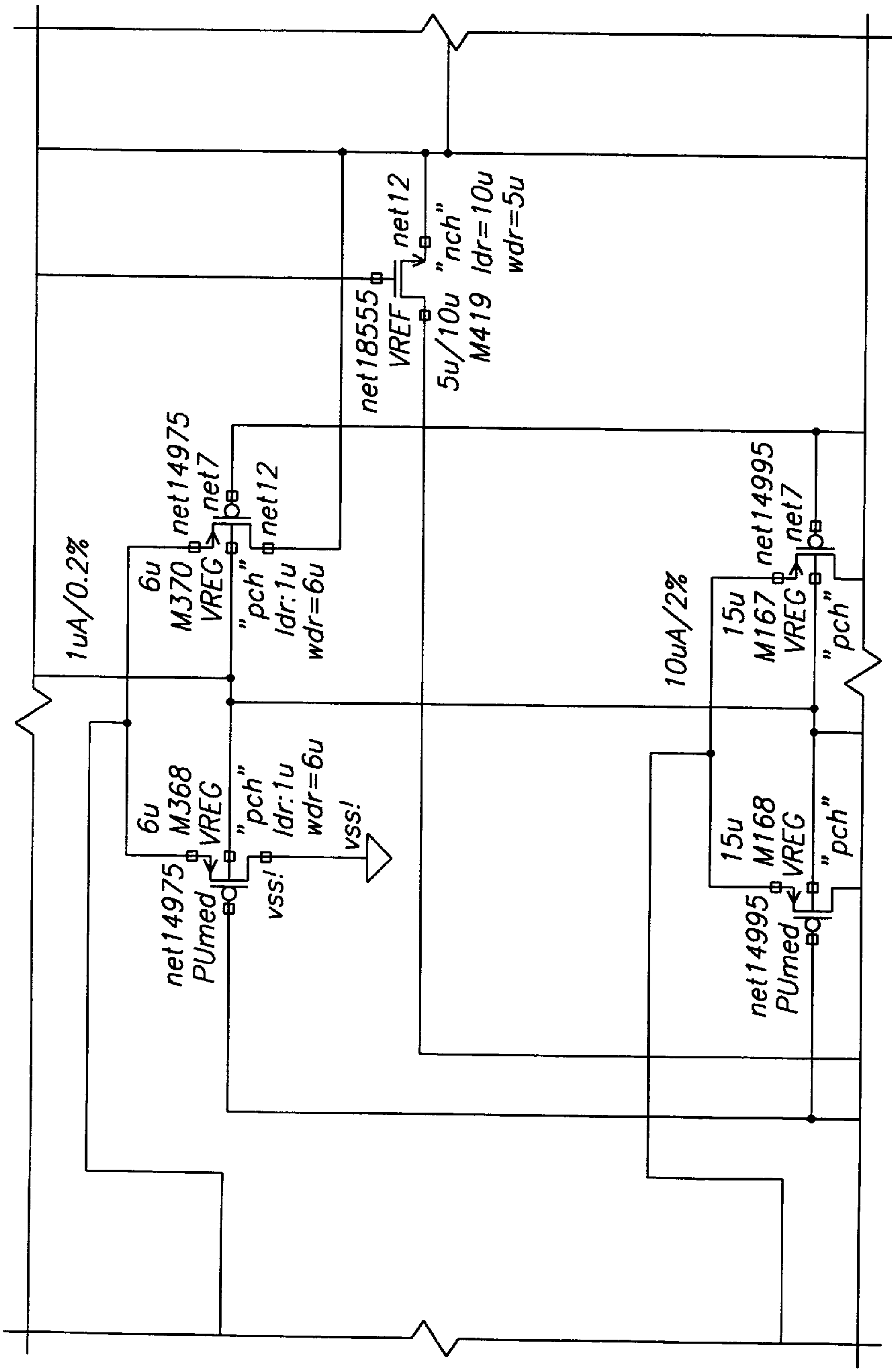
Fig. 8.050.4CC

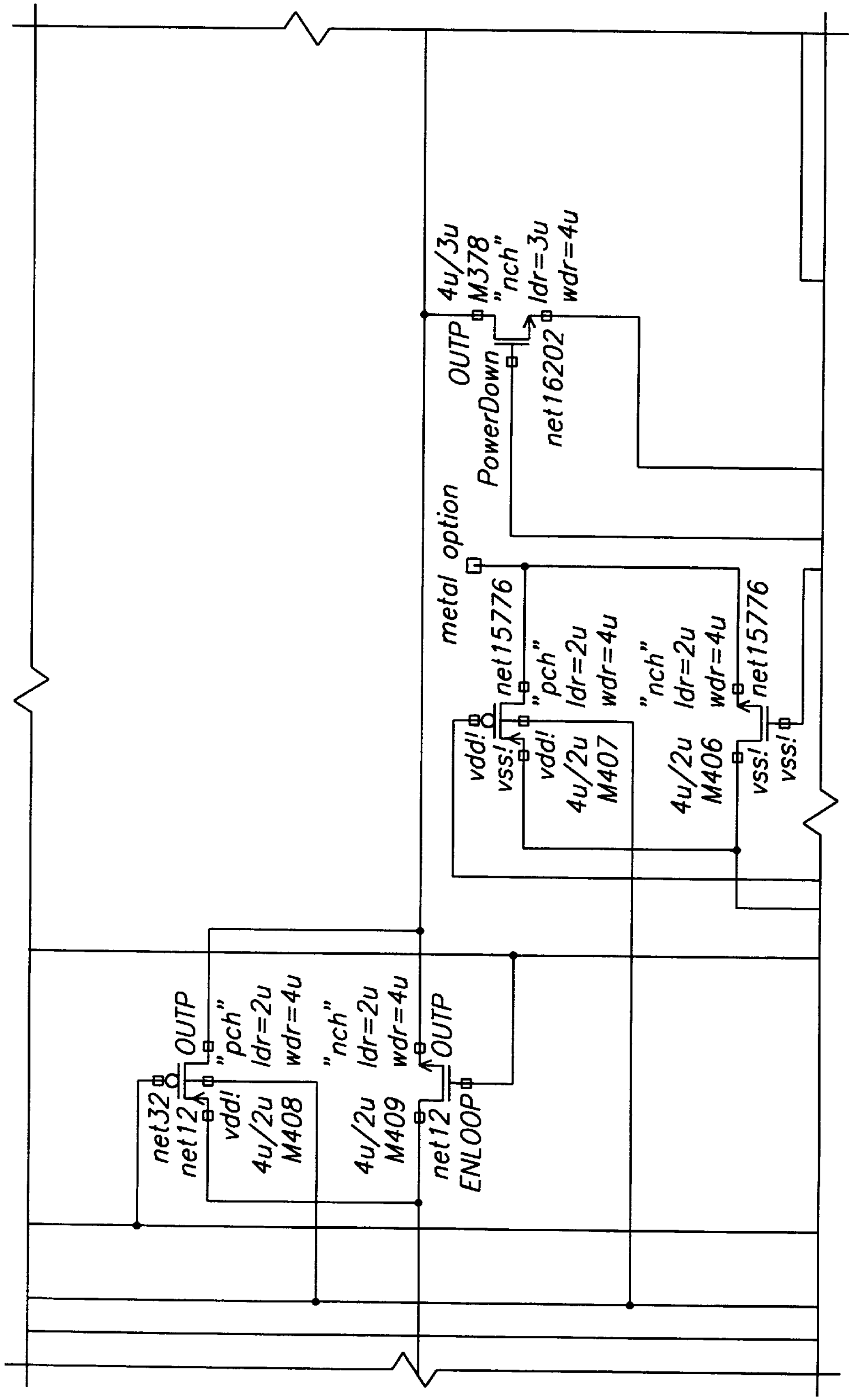
FIG. 8.0504CD

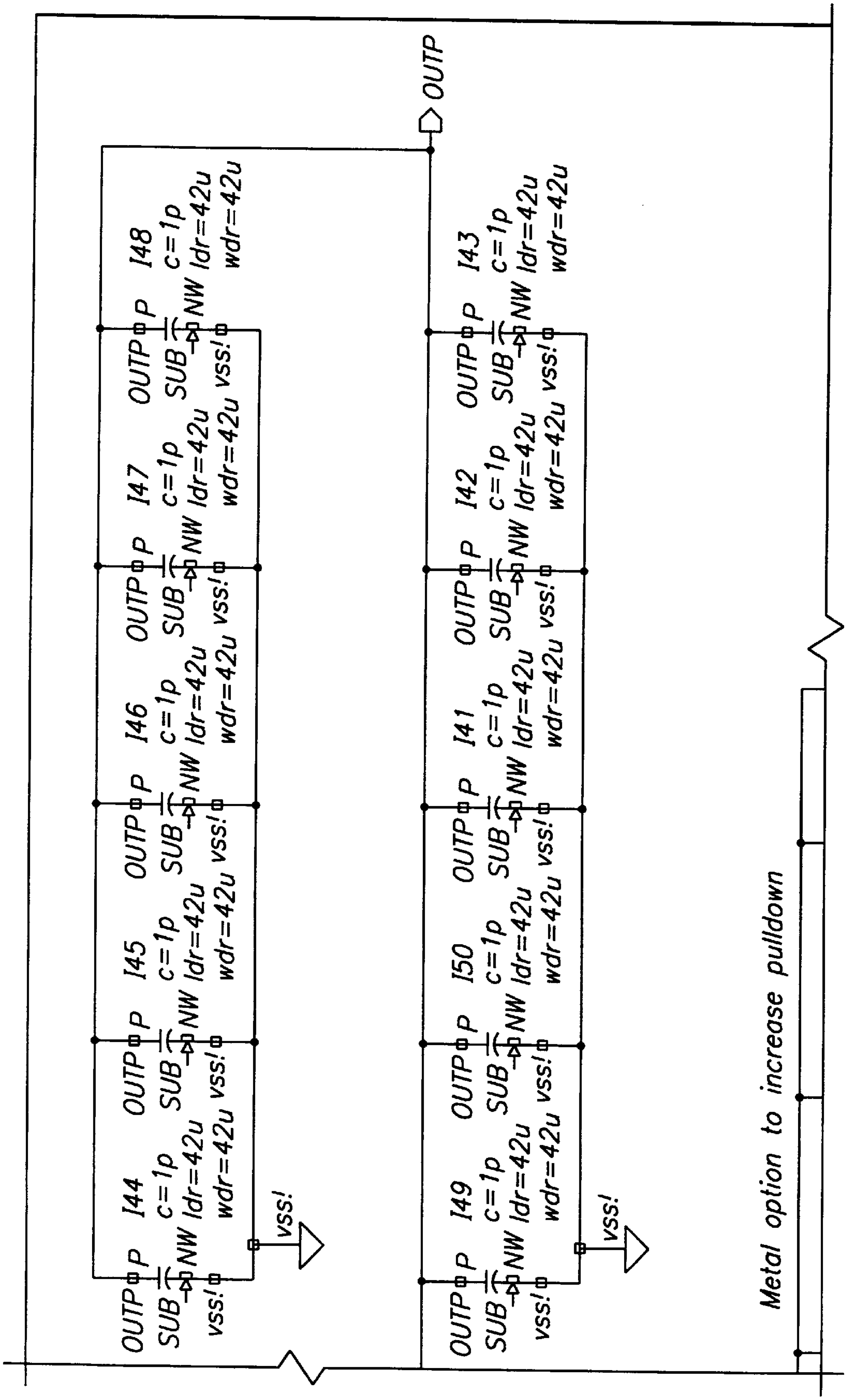
FIG. 8.050.4CE

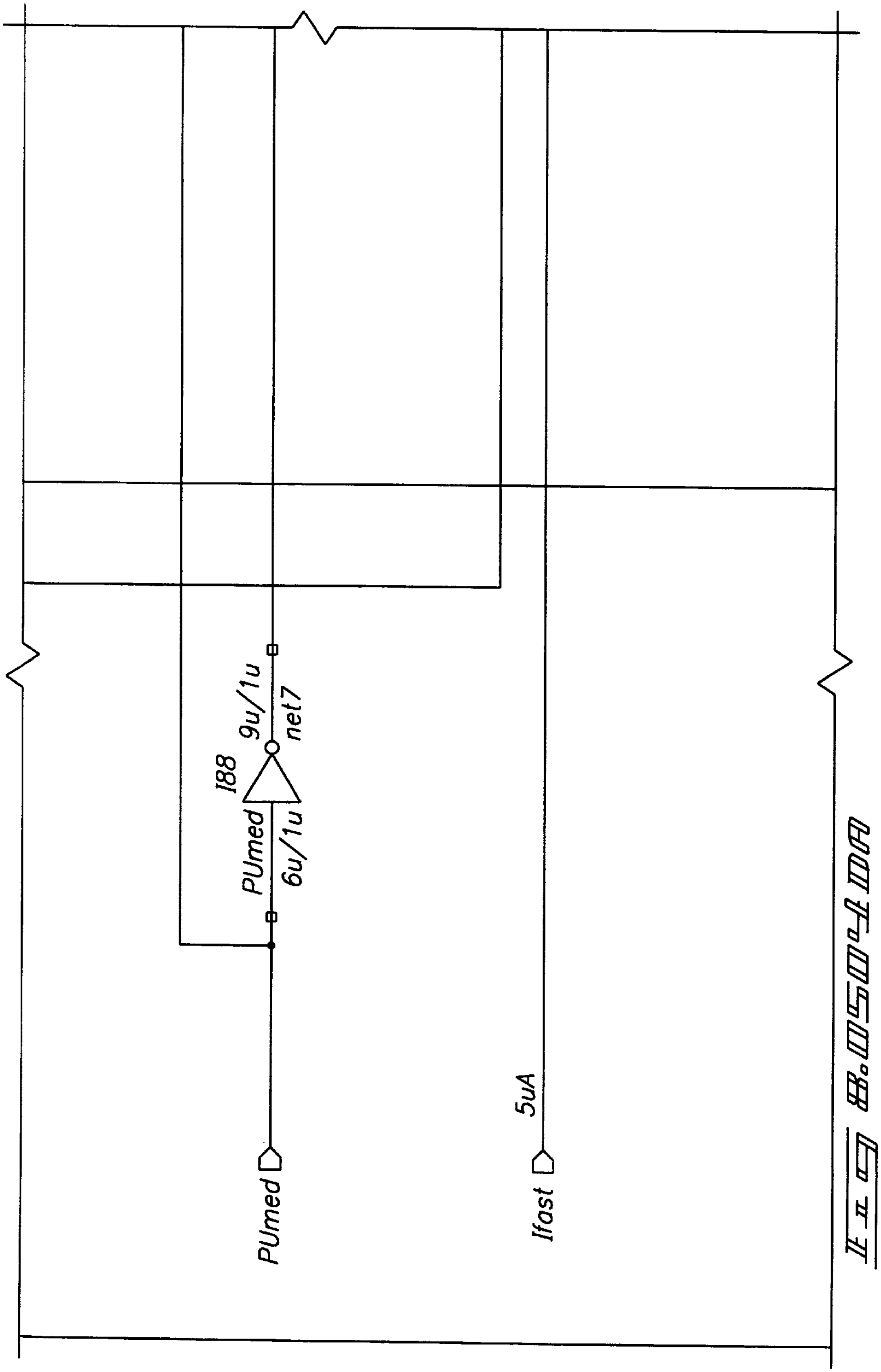
FIG. 8.0504DA

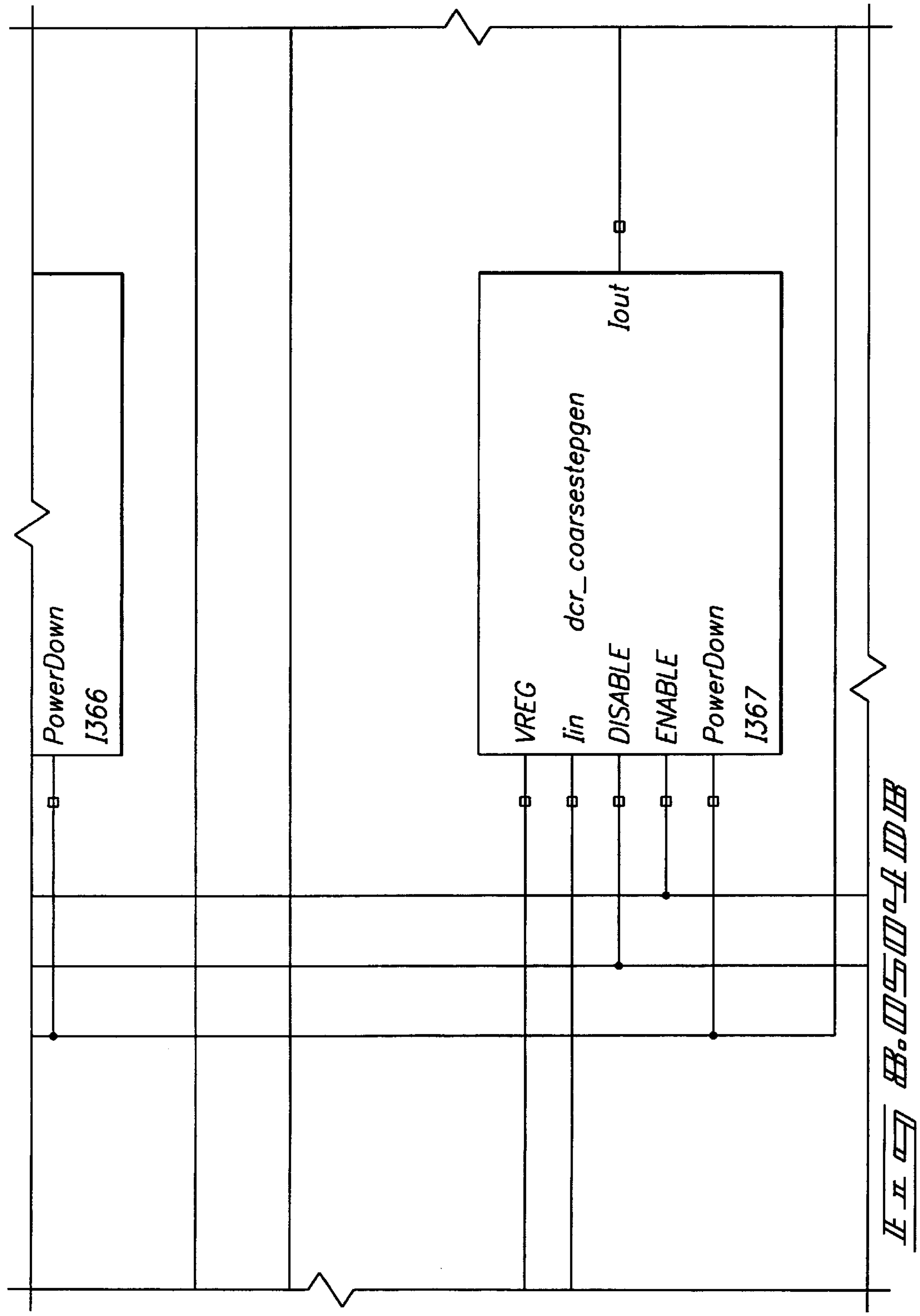
Fig. 8.0504DB

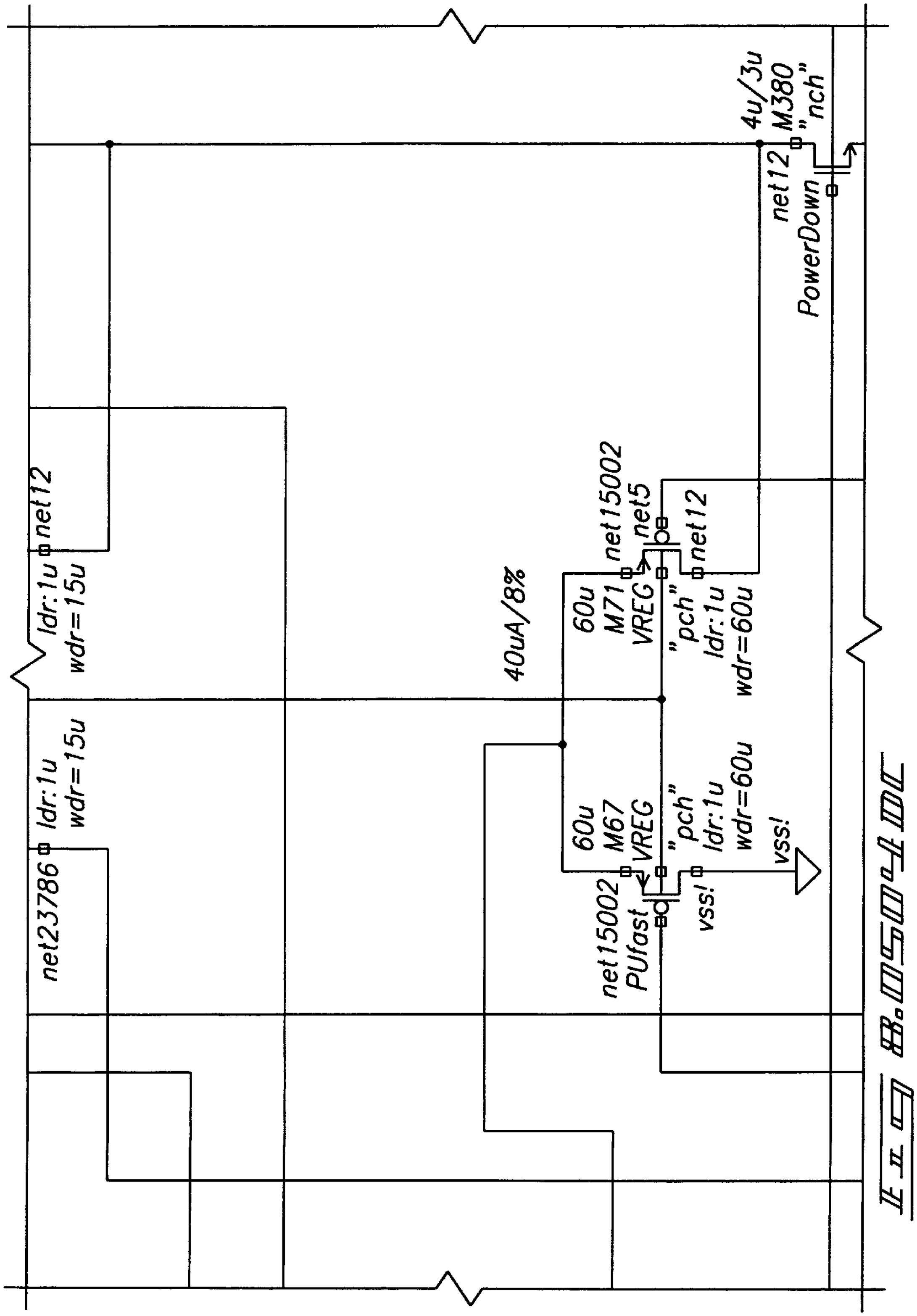
Fig. 8.0504DC

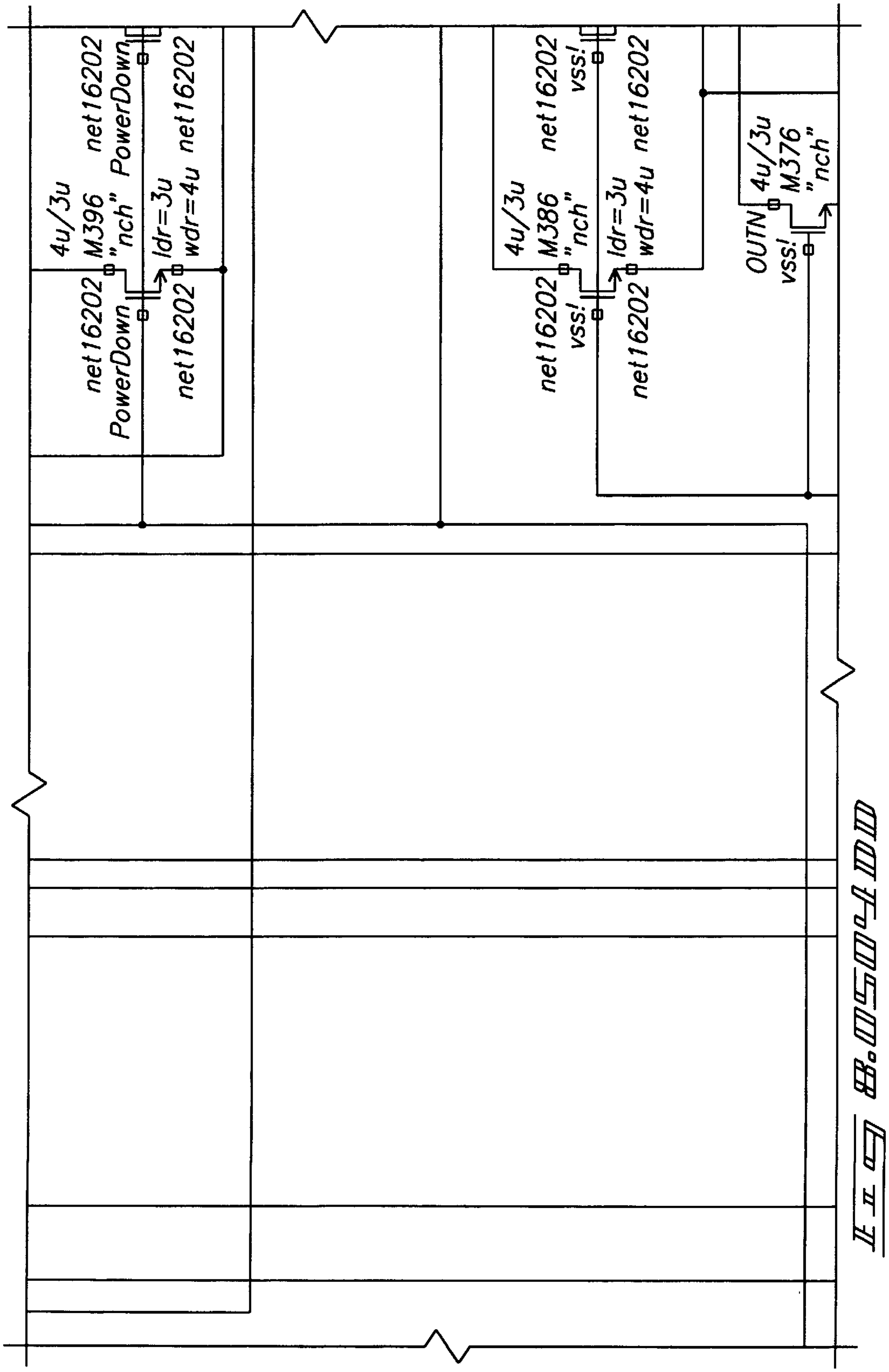
FIG. 8.0504DD

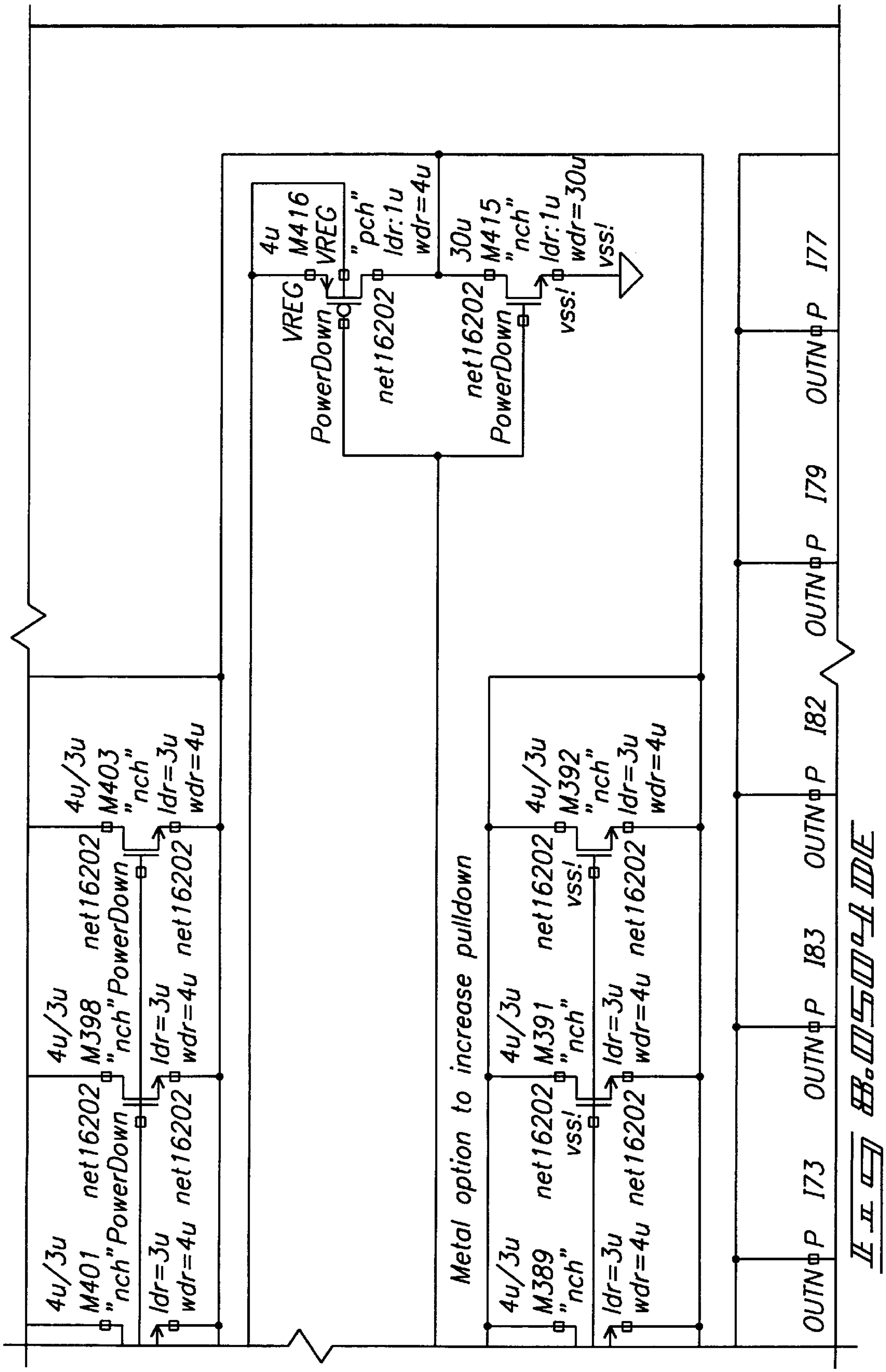
4u
M416
VREG
"pch"
ldr:1u
wdr=4u
30u
M415
"nch"
ldr:1u
wdr=30u
vss!
VREG
PowerDown
net16202
net16202
PowerDown
vss!
4u/3u
M403
"nch"
ldr=3u
wdr=4u
net16202
PowerDown
net16202
4u/3u
M398
"nch"
ldr=3u
wdr=4u
net16202
PowerDown
net16202
4u/3u
M401
"nch"
ldr=3u
wdr=4u
Metal option to increase pulldown
4u/3u
M392
"nch"
ldr=3u
wdr=4u
net16202
vss!
net16202
4u/3u
M391
"nch"
ldr=3u
wdr=4u
net16202
vss!
net16202
4u/3u
M389
"nch"
ldr=3u
wdr=4u
OUTN P I77
OUTN P I79
OUTN P I82
OUTN P I83
OUTN P I73
OUTN P

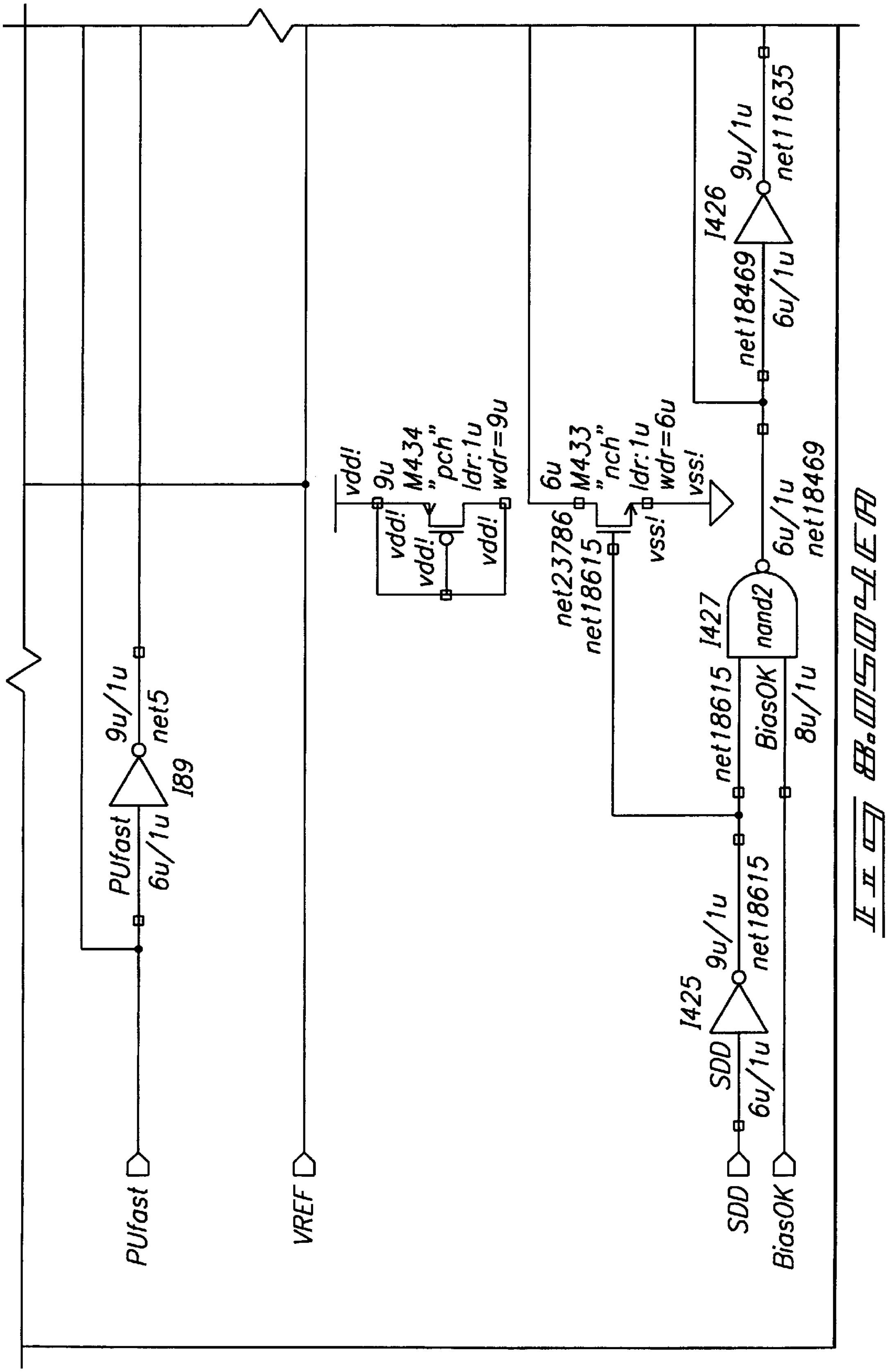
Fig. 8.0504EA

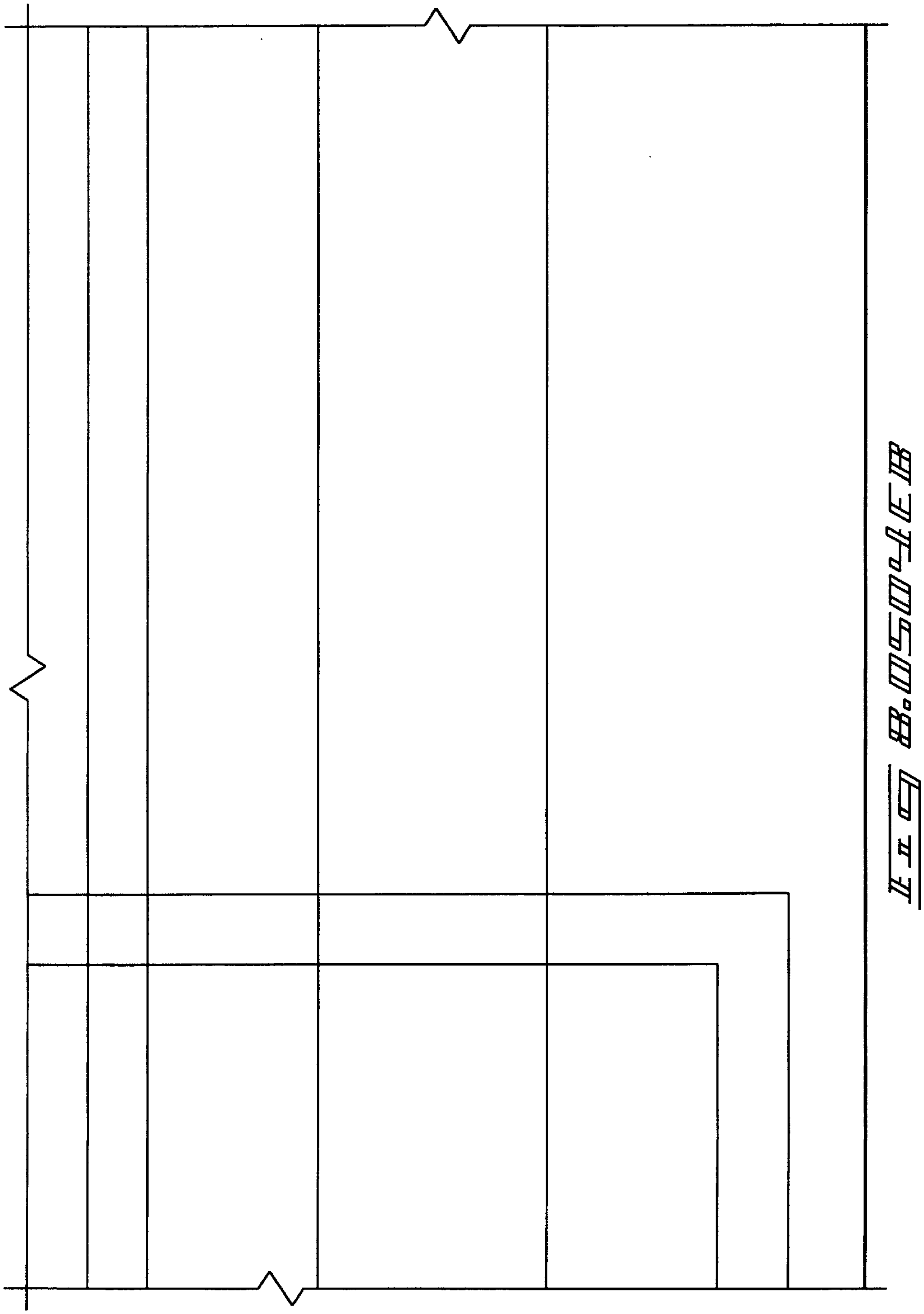
Fig. 8.050.4EB

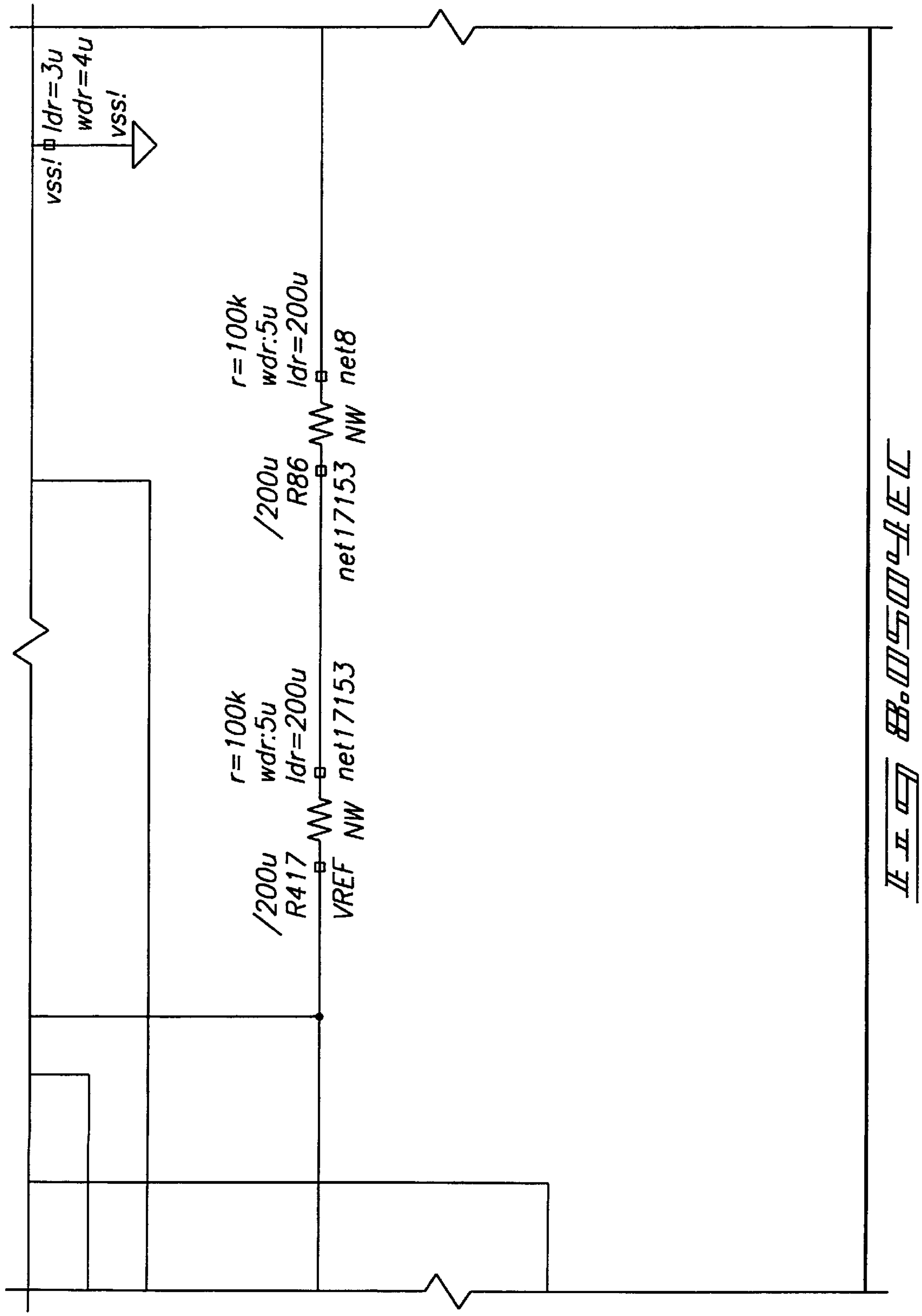
FIG. 8.05.04C

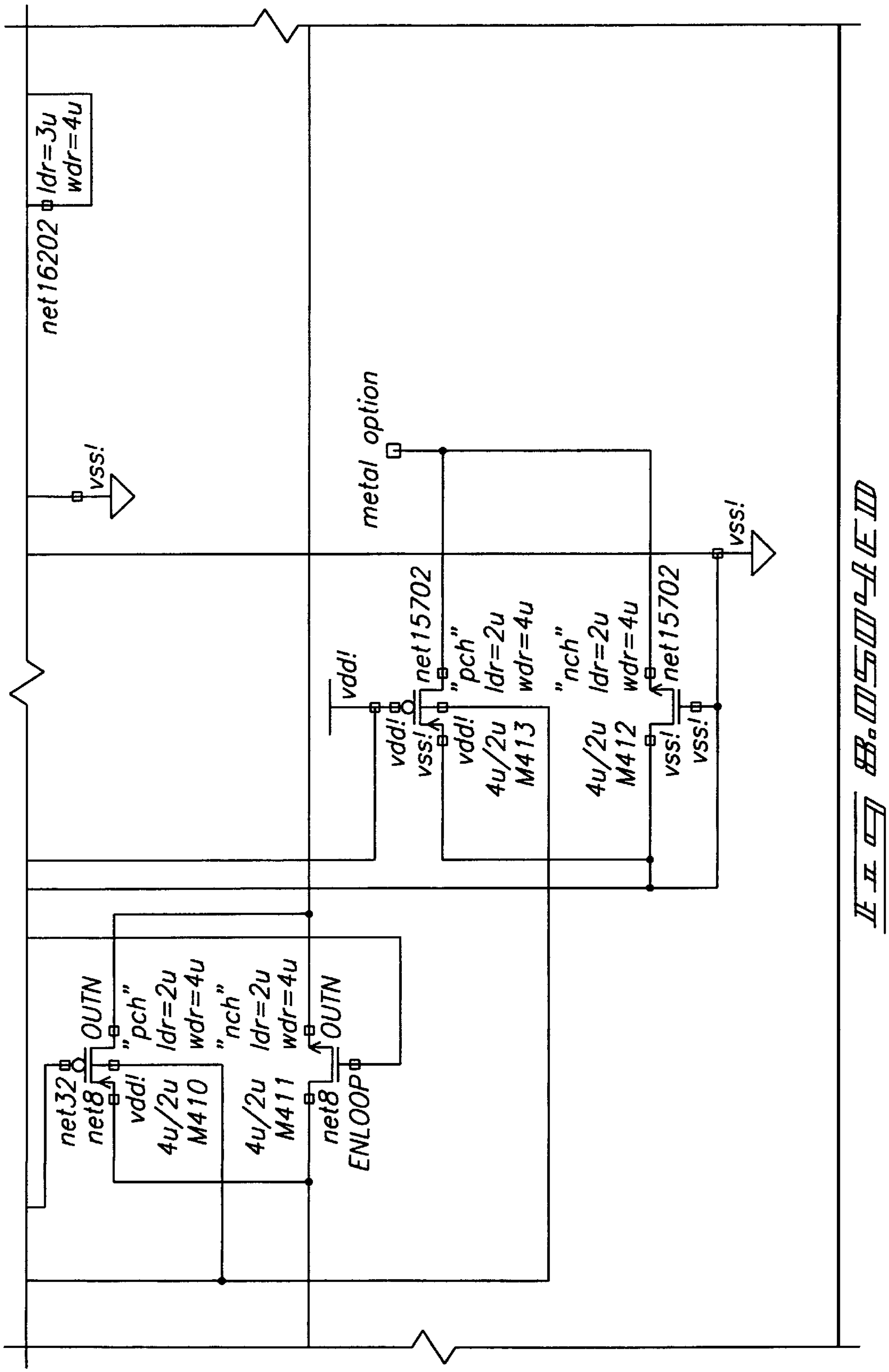
FIG. 8.0504ED

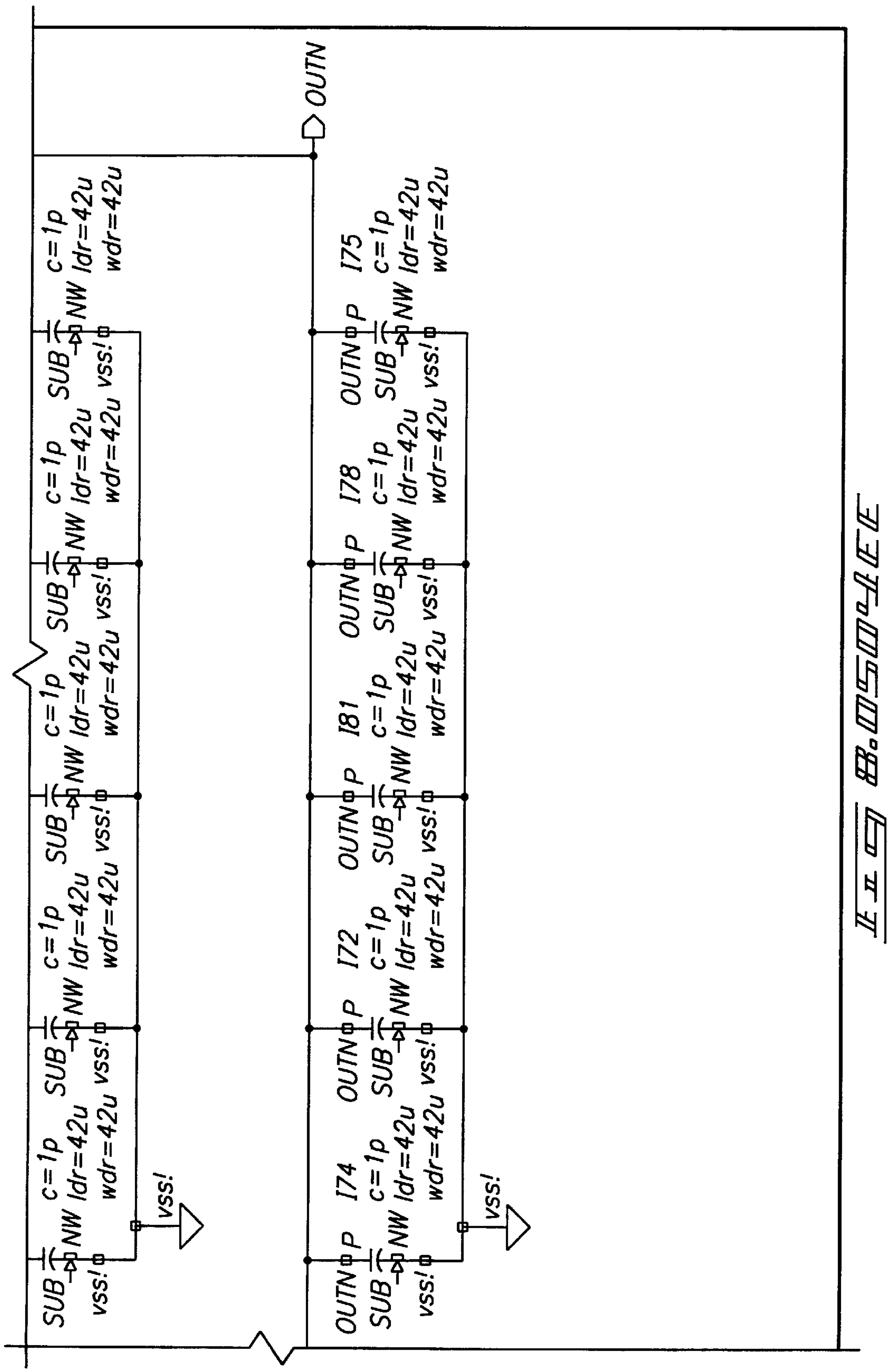
Fig. 8.050.4EE

| | | | | | | | | | | |
|---|---|---|---|---|---|---|---|---|---|---|
| 8.050401AA | 8.050401AB | 8.050401AC | 8.050401AD | 8.050401AE | 8.050401AF | 8.050401AG | 8.050401AH | 8.050401AI | 8.050401AJ | |
| 8.050401BA | 8.050401BB | 8.050401BC | 8.050401BD | 8.050401BE | 8.050401BF | 8.050401BG | 8.050401BH | 8.050401BI | 8.050401BJ | 8.050401BK |
| 8.050401CA | 8.050401CB | 8.050401CC | 8.050401CD | 8.050401CE | 8.050401CF | 8.050401CG | 8.050401CH | 8.050401CI | 8.050401CJ | 8.050401CK |

Fig 8.050401

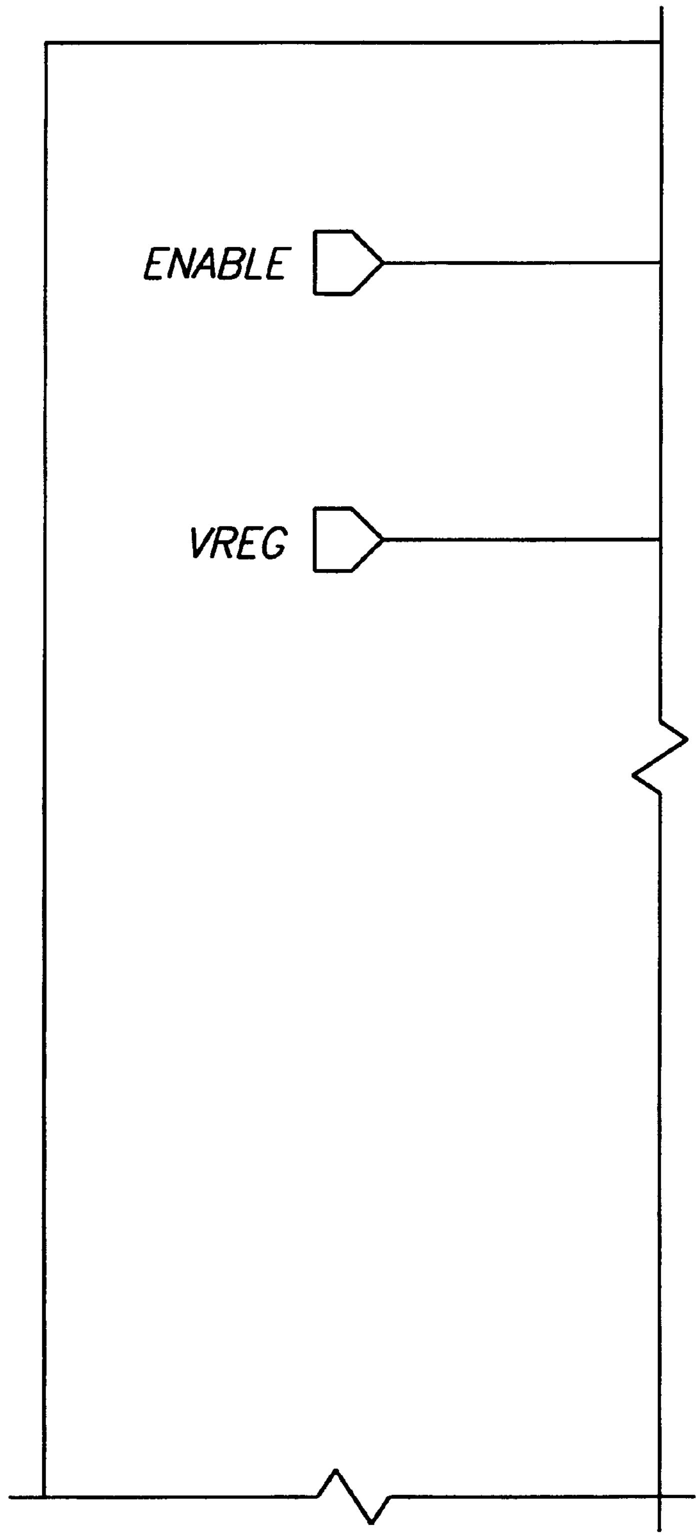
FIG 8.050401AA

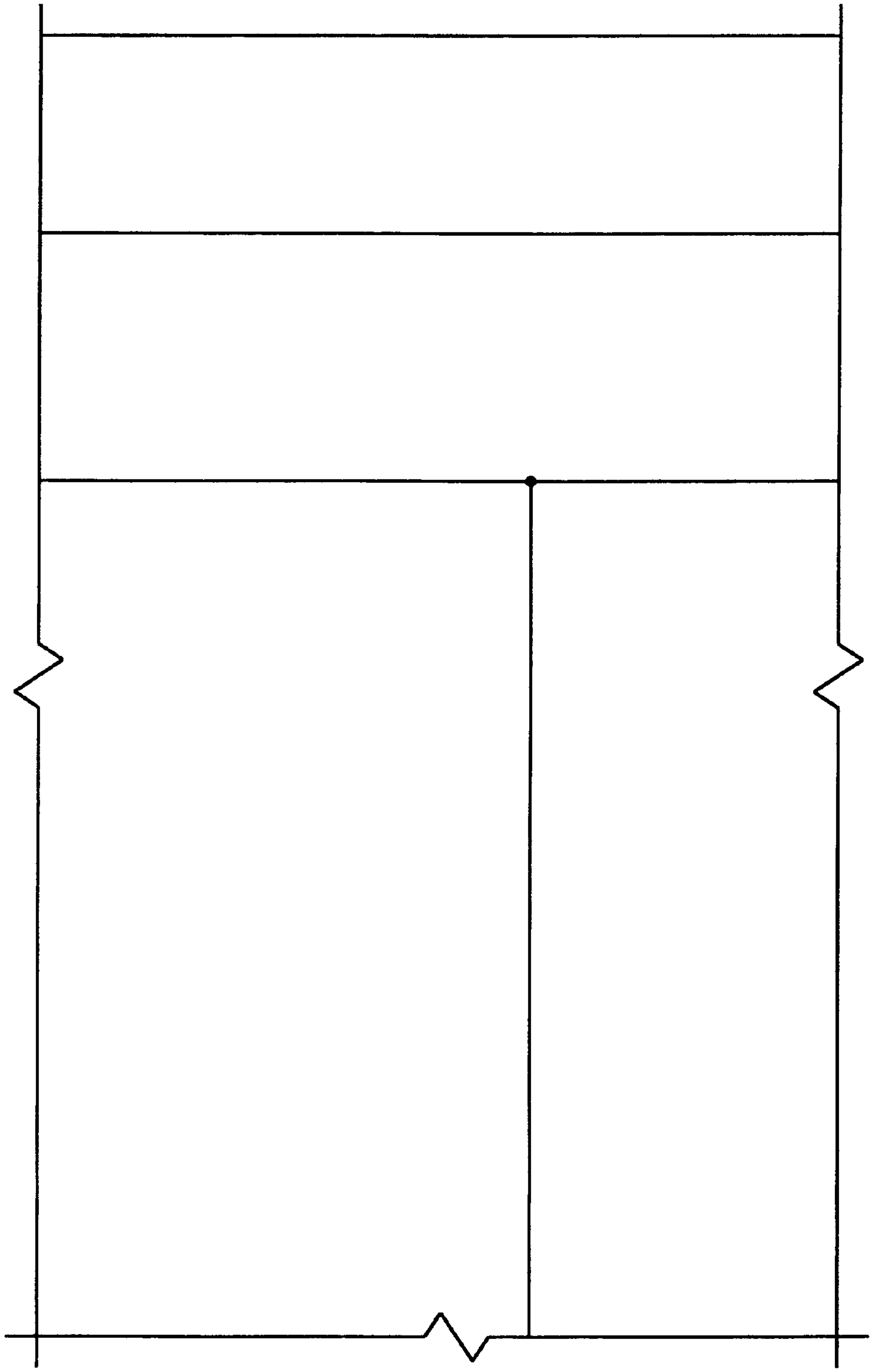
FIG. 8.050401AB

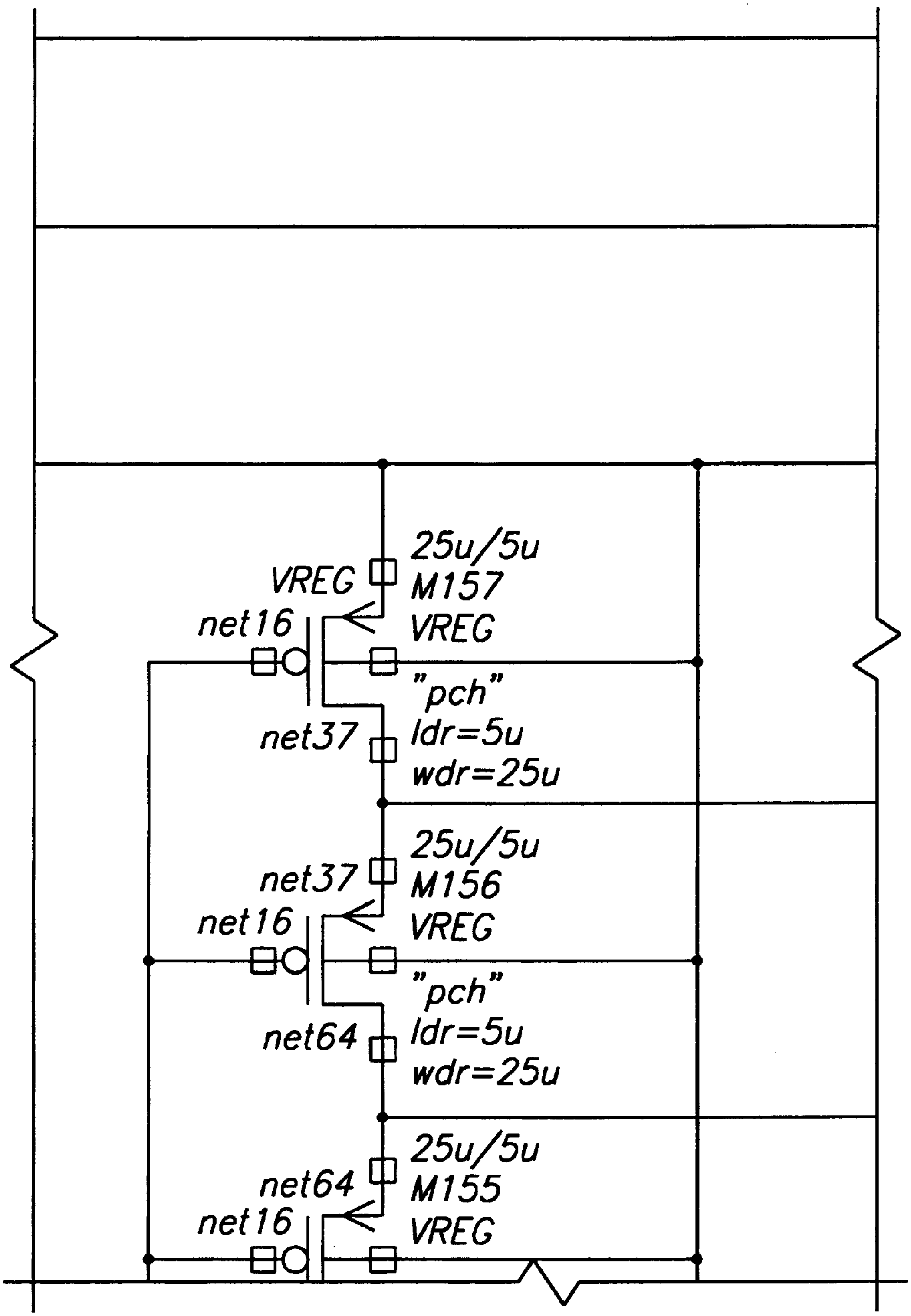
Fig 8.050401AC

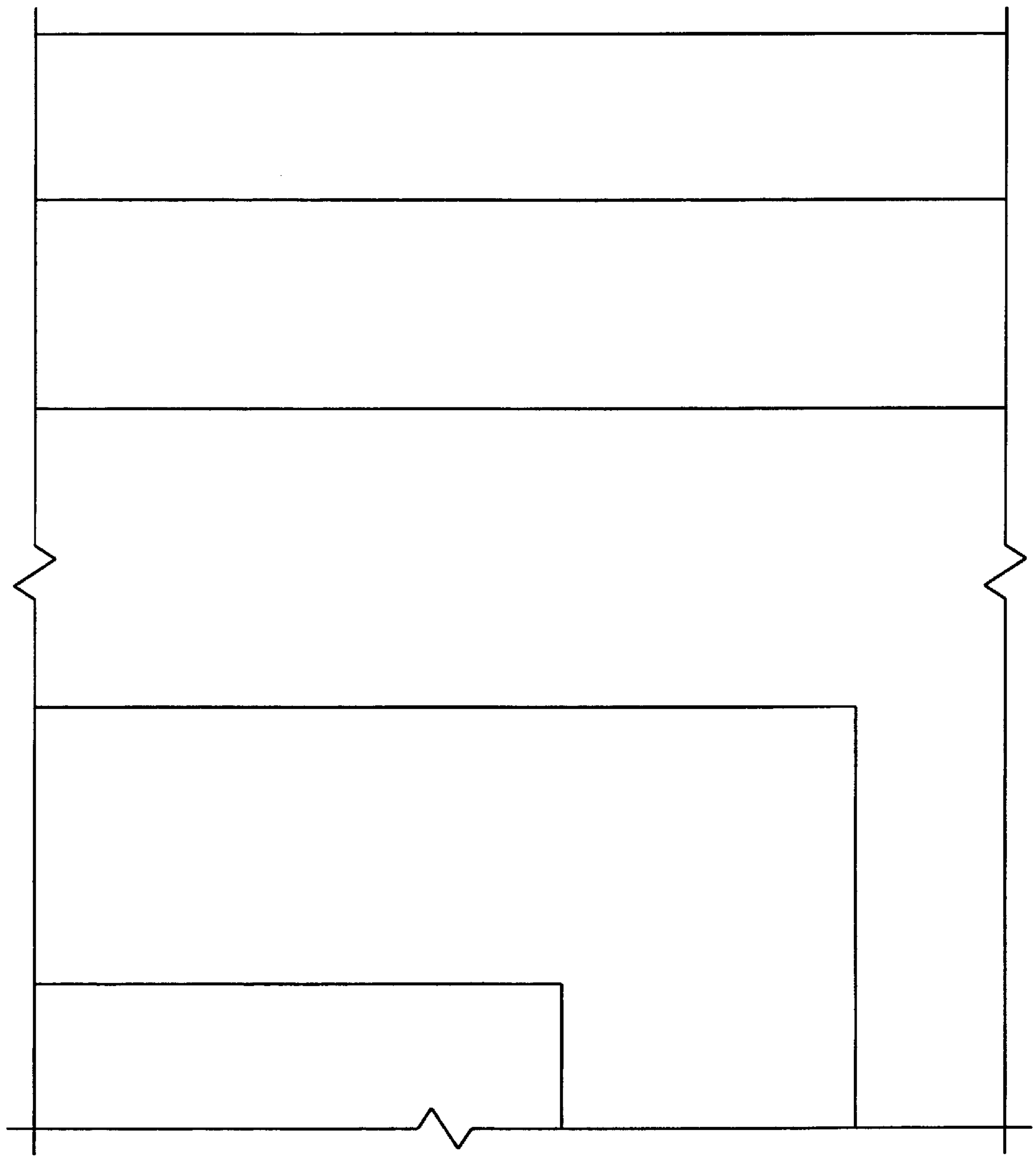
Fig 8.050401AD

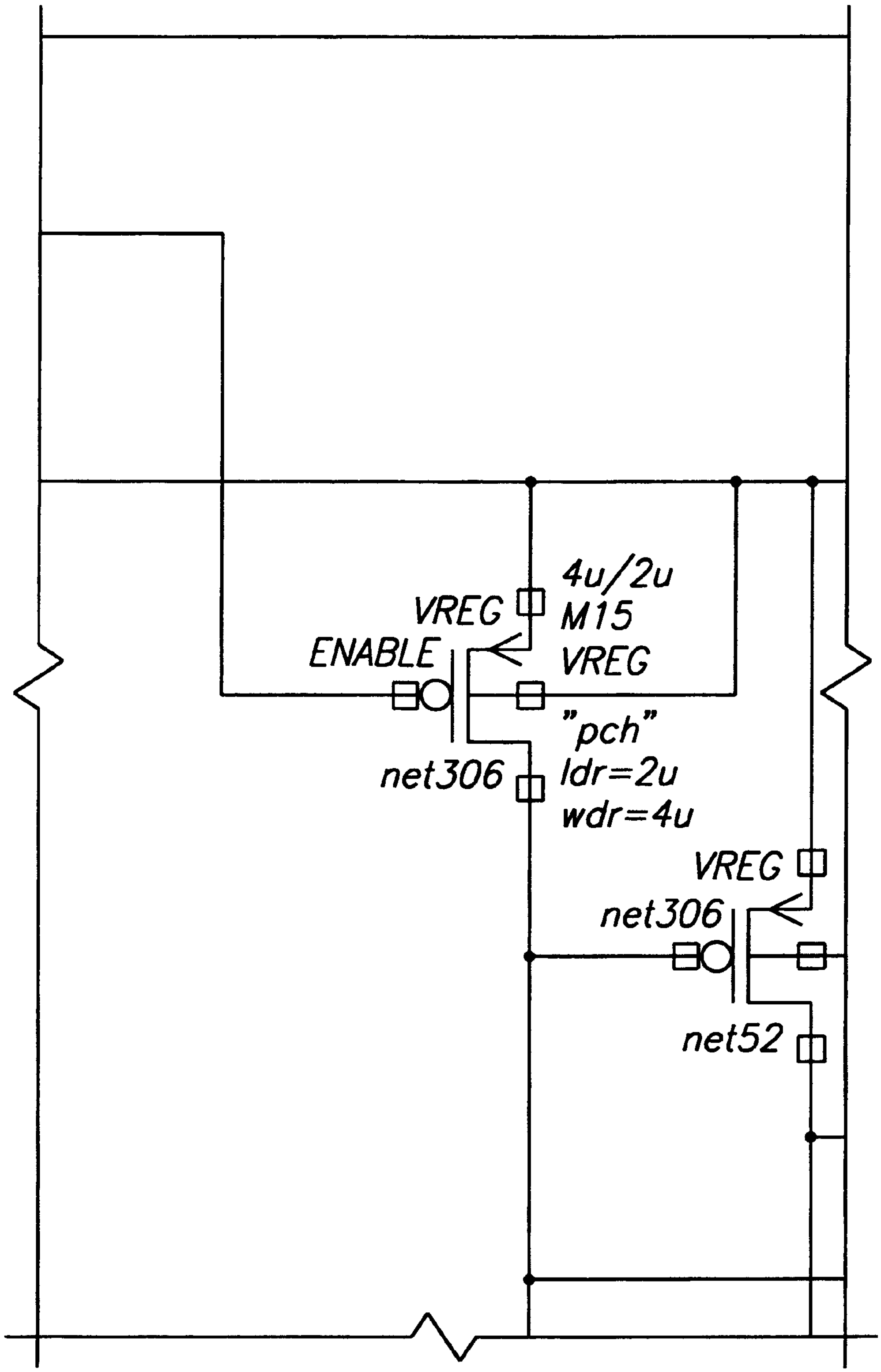
Fig. 8.05040IAE

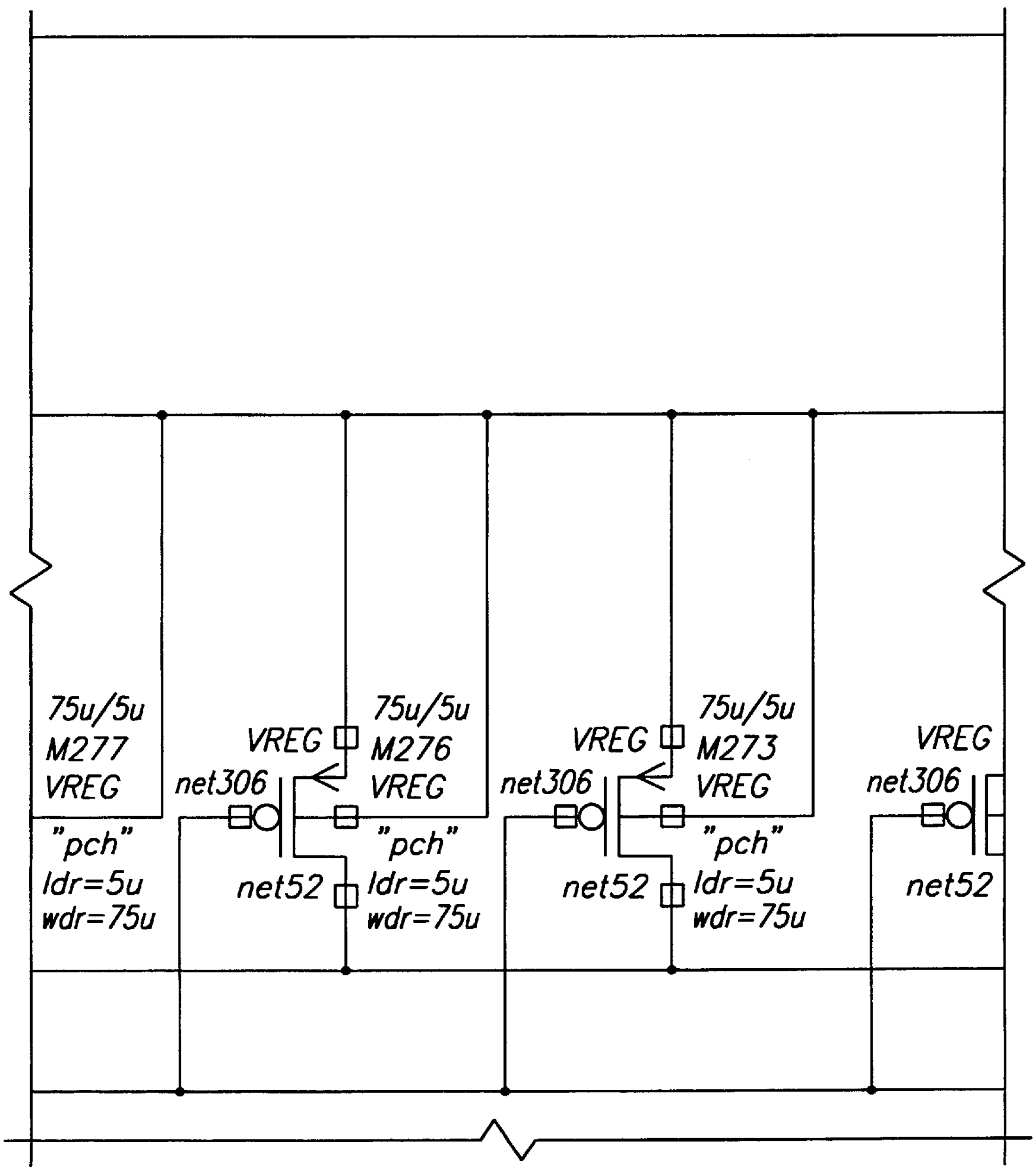
FIG. 8.050401AF

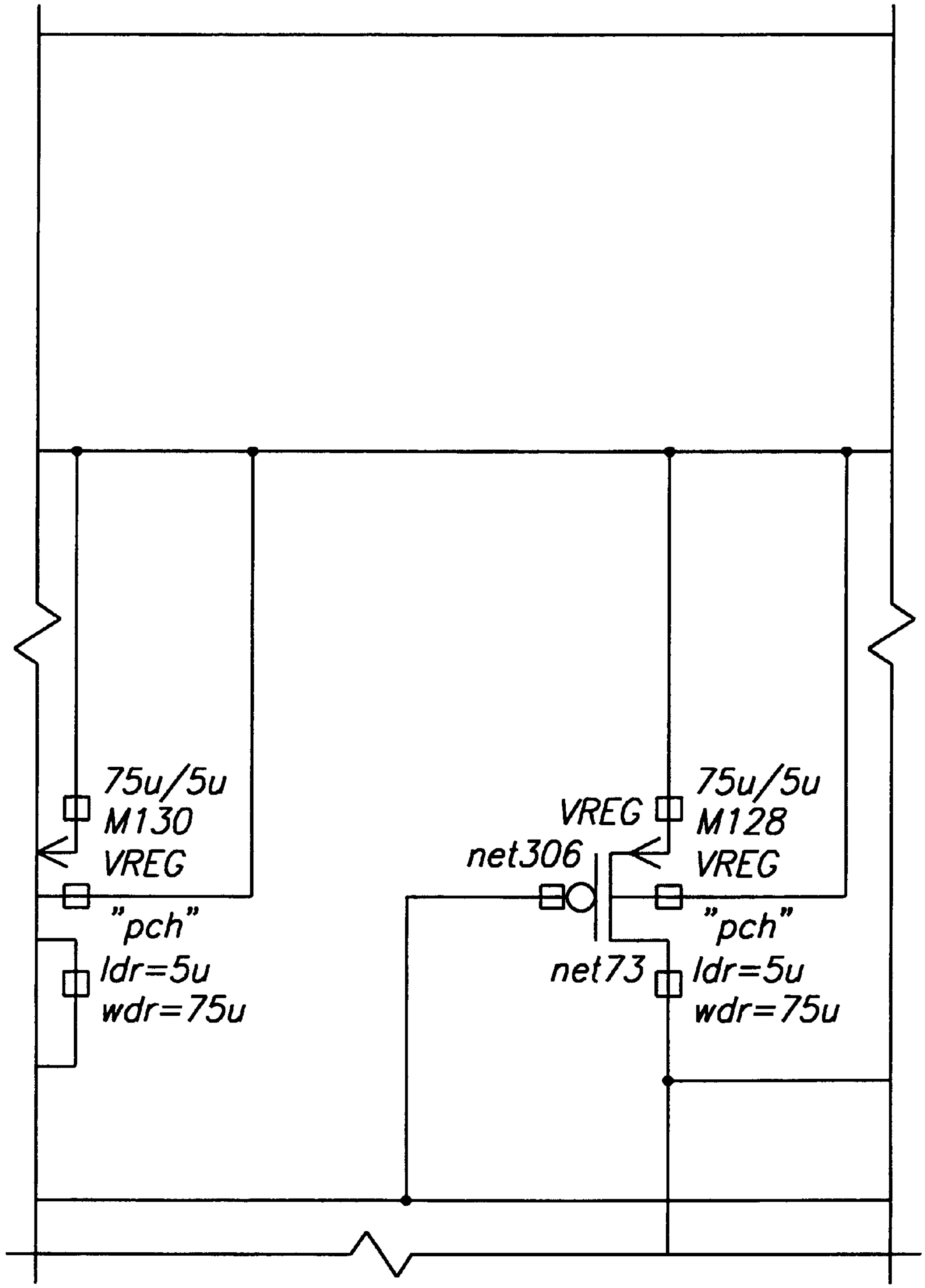
Fig 8.0504 01AG

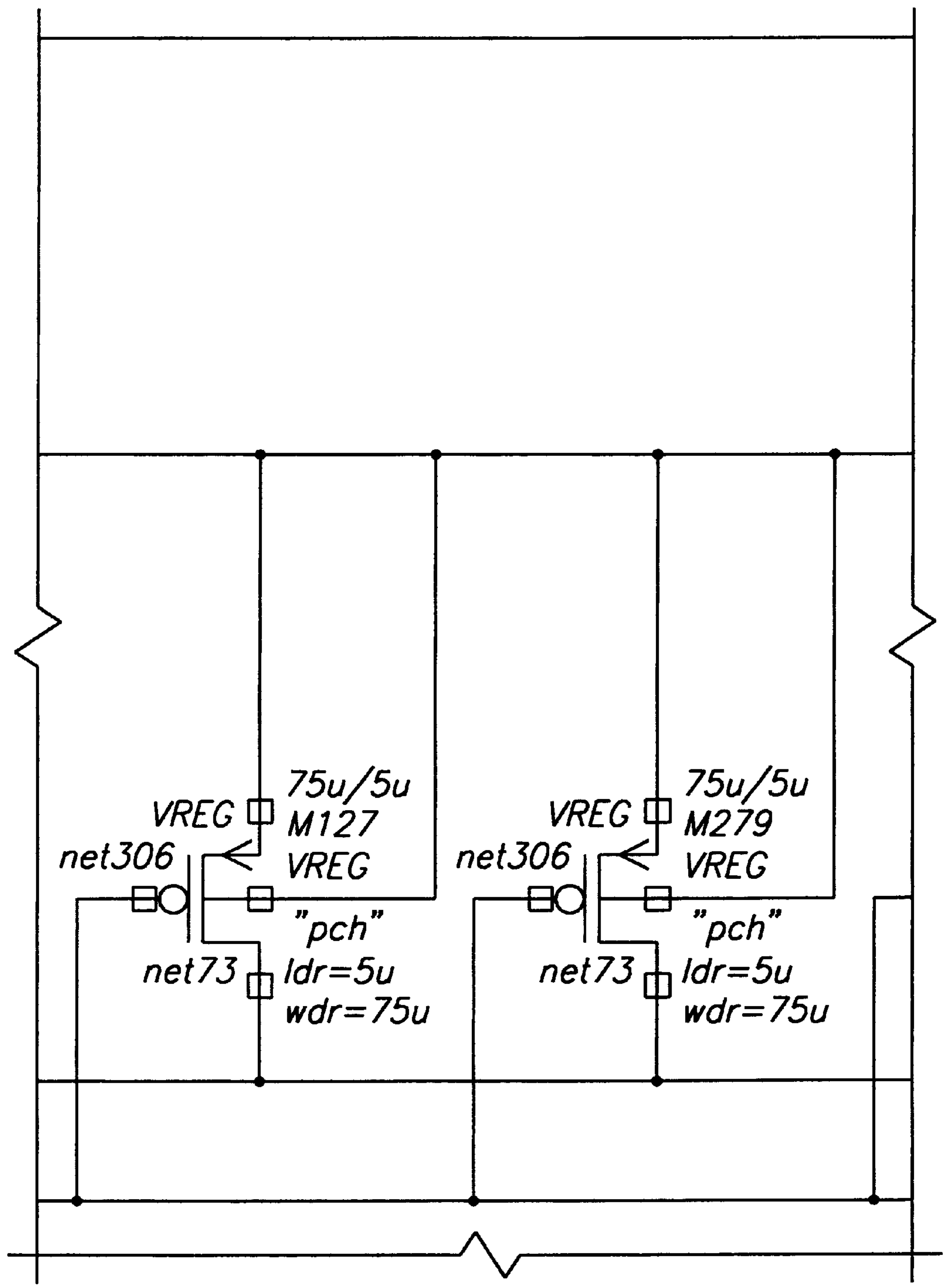
Fig 8.05040.1AH

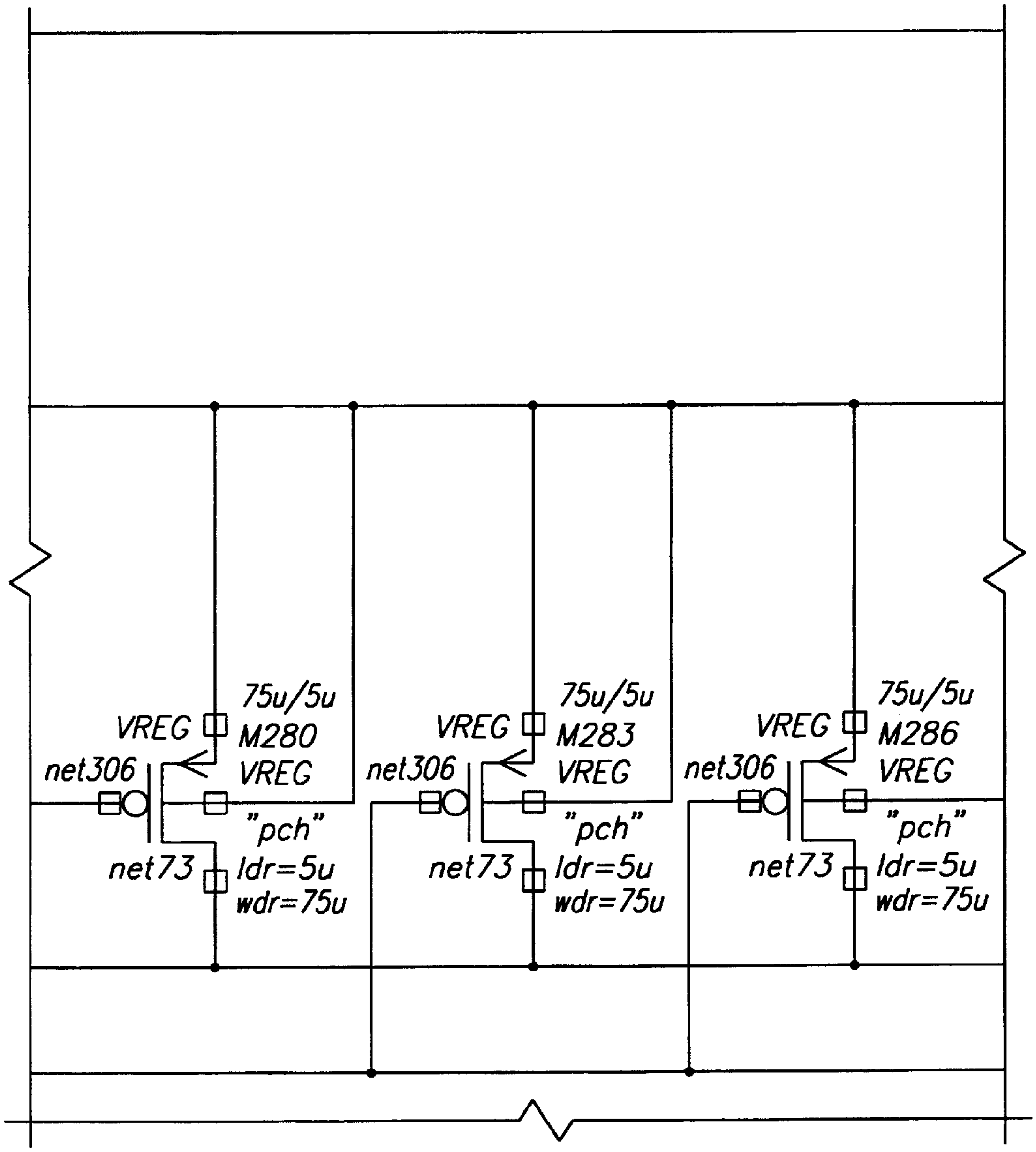
Fig 8.05040IAI

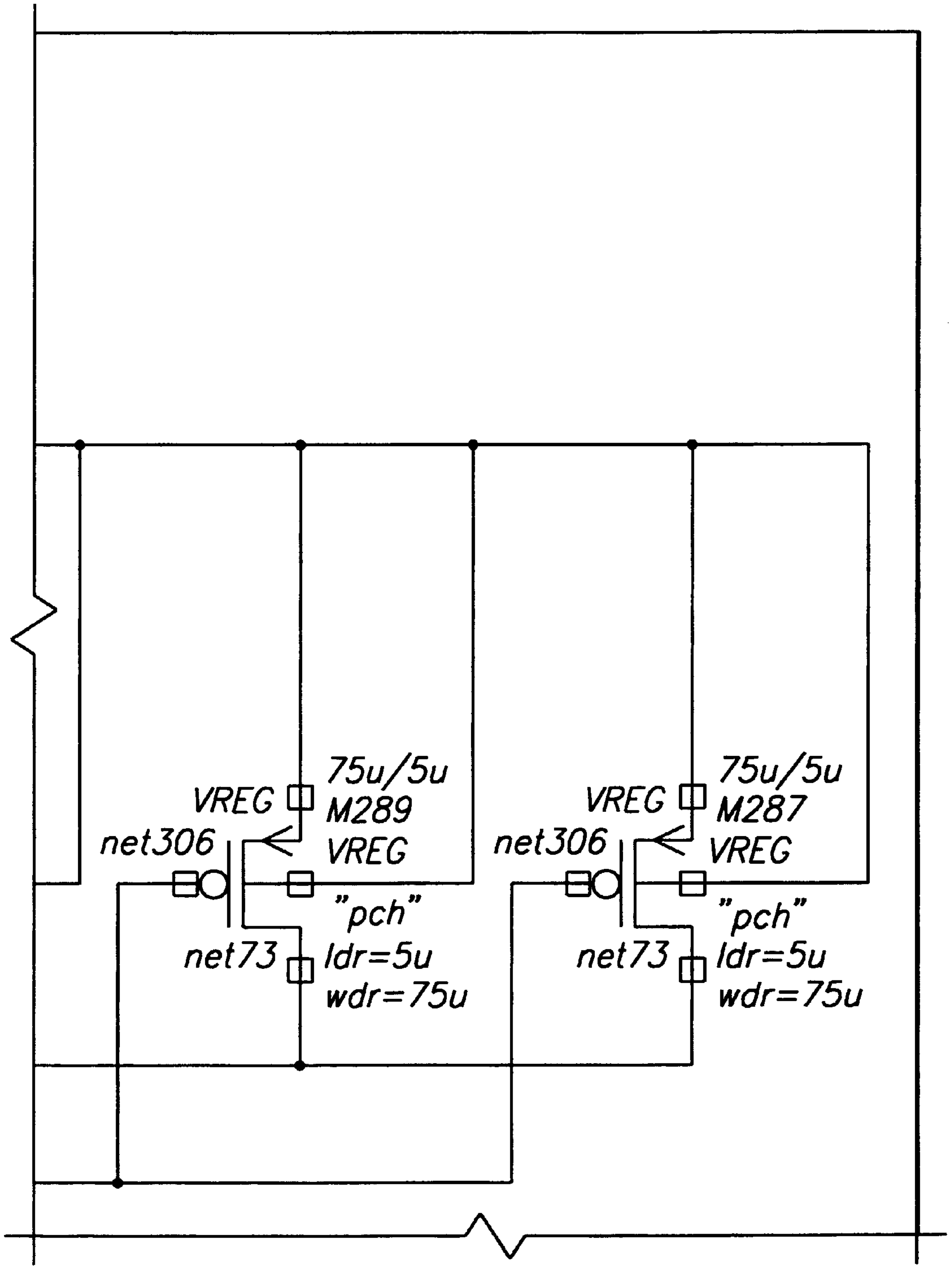
Fig 8.05O4O1AJ

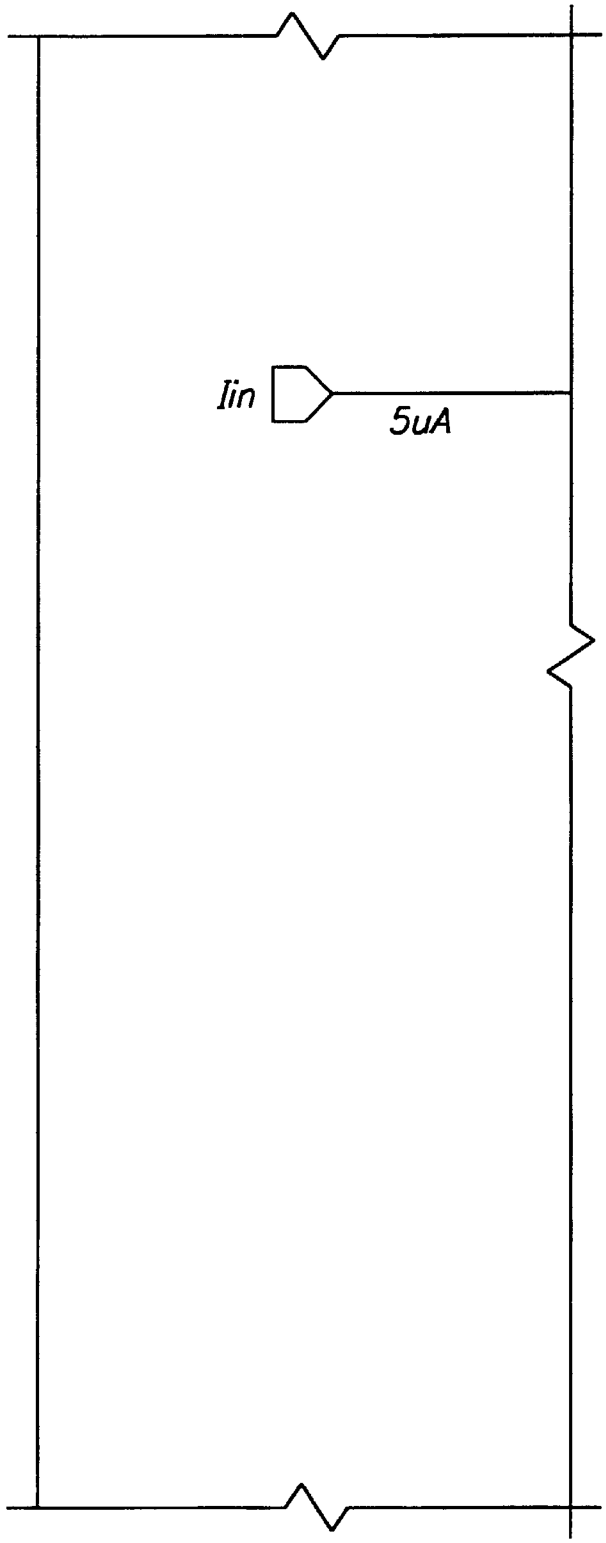
Fig 8.0504018A

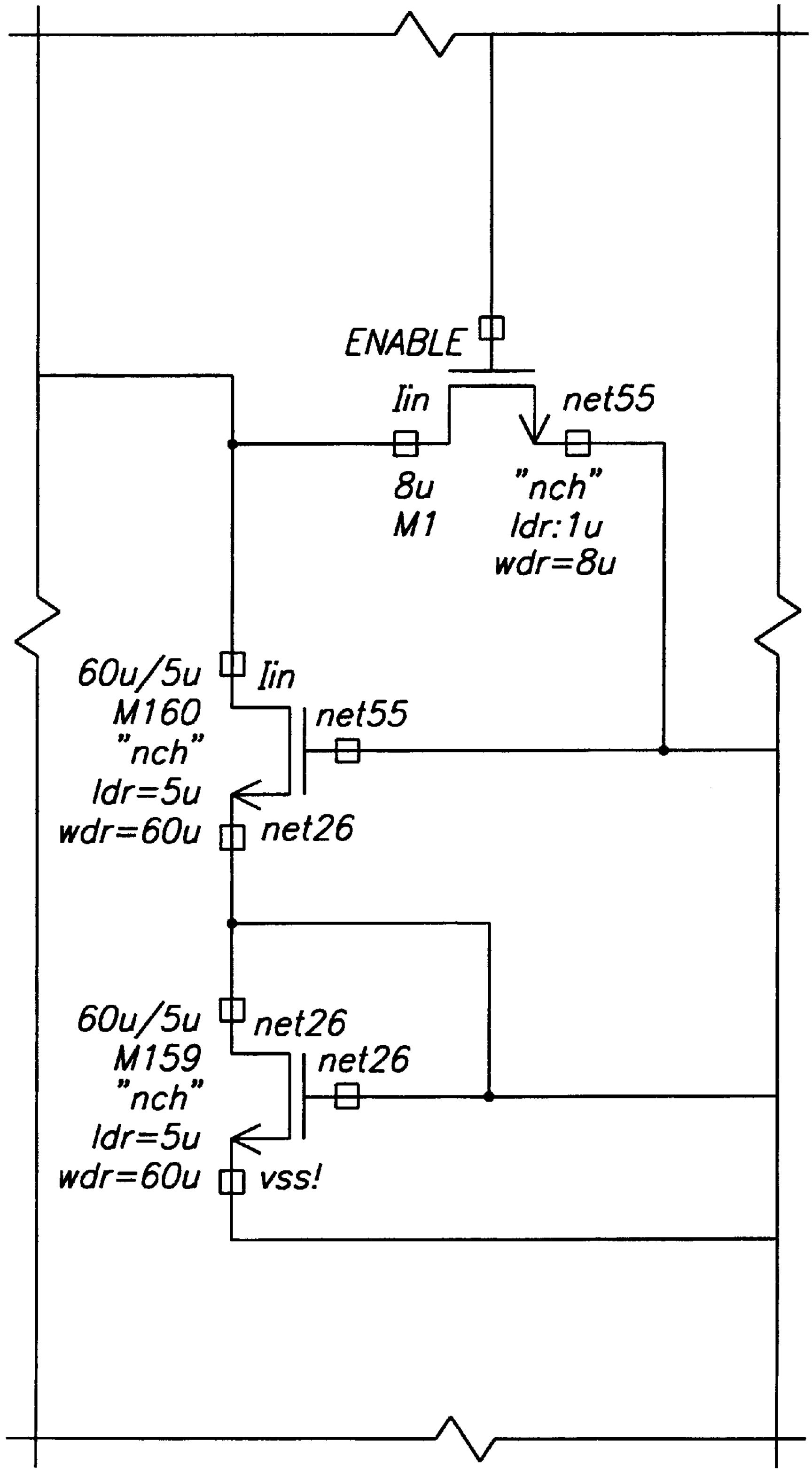
Fig 8.050401BB

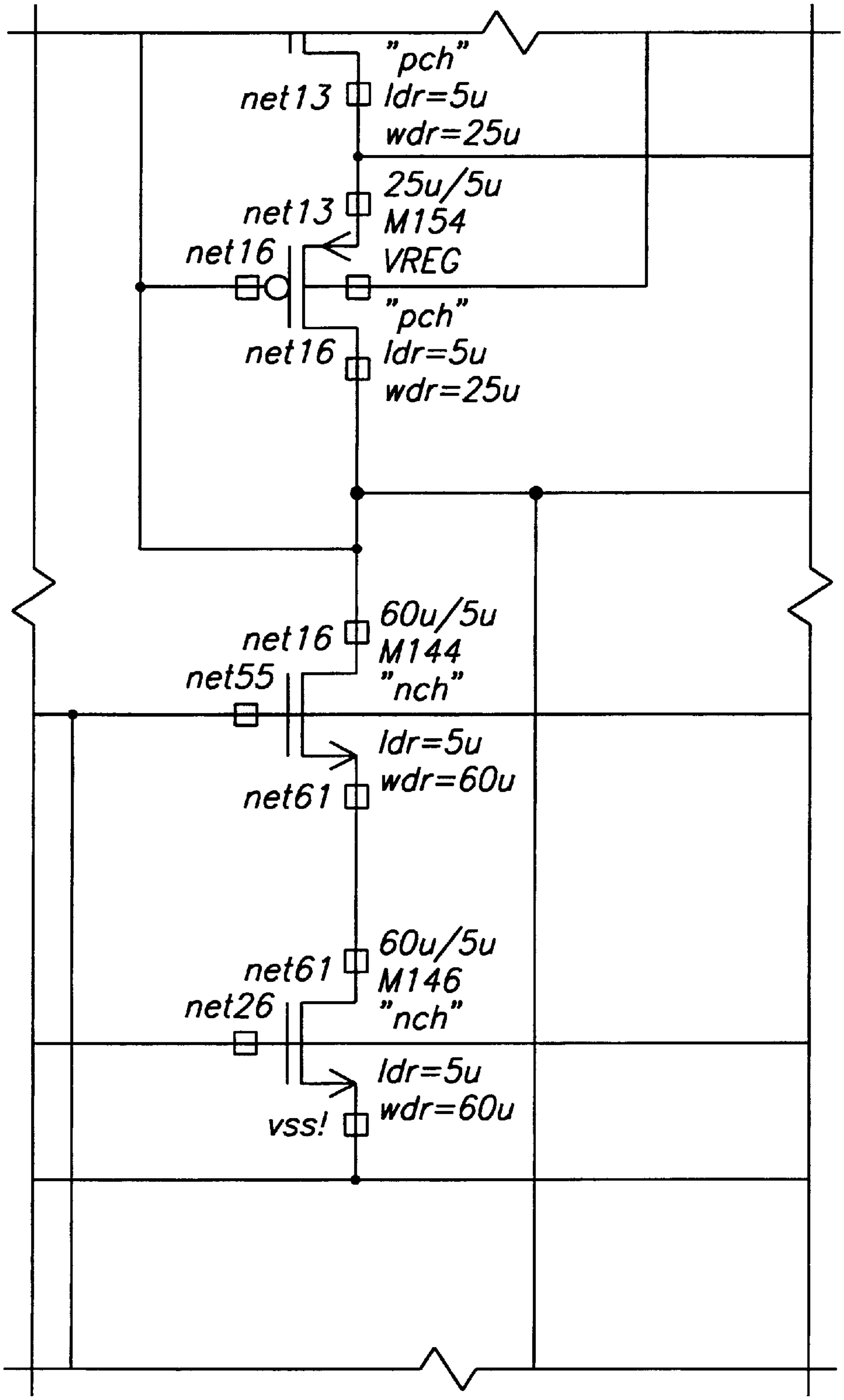
FIG 8.050401BC

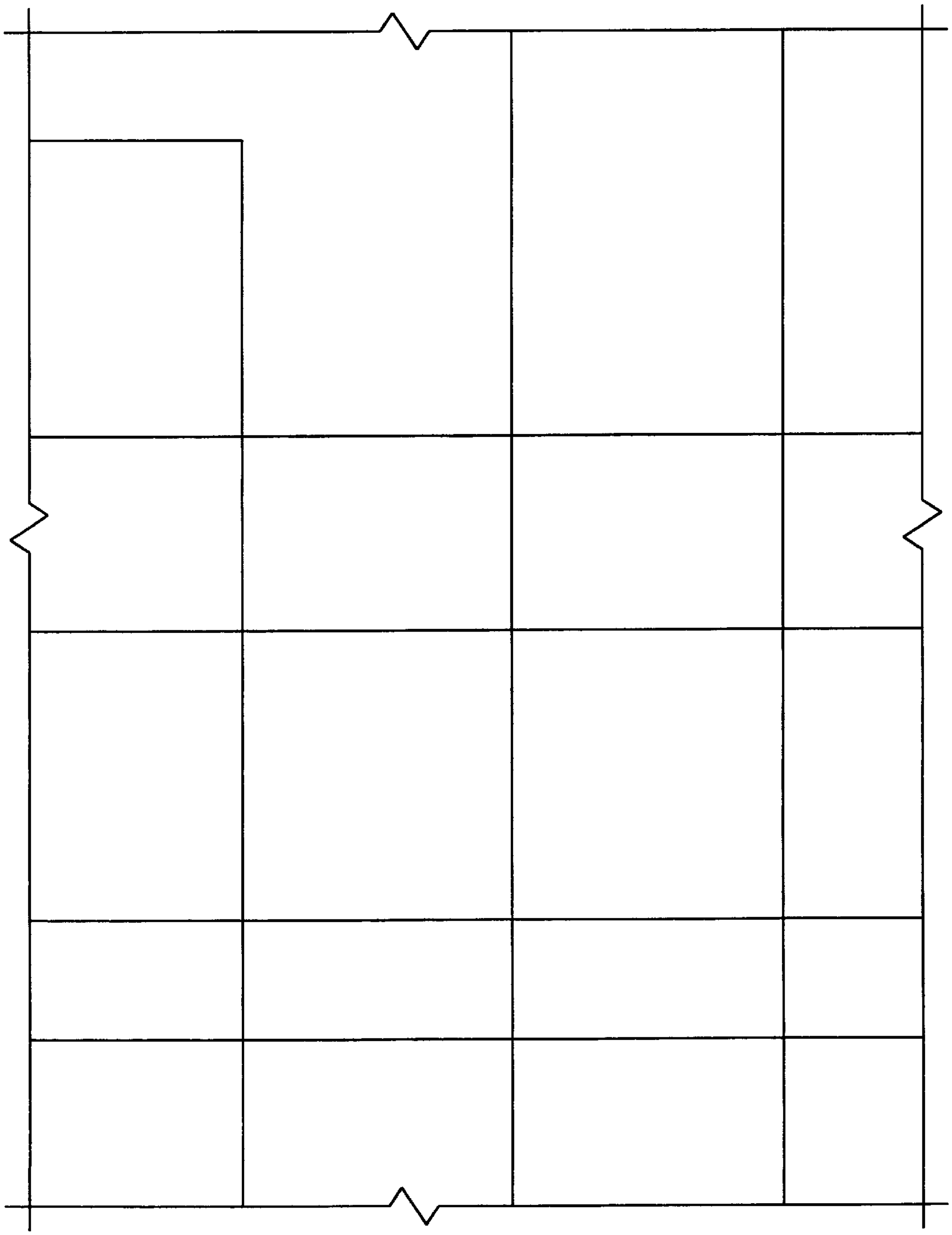
Fig 8.050401BD

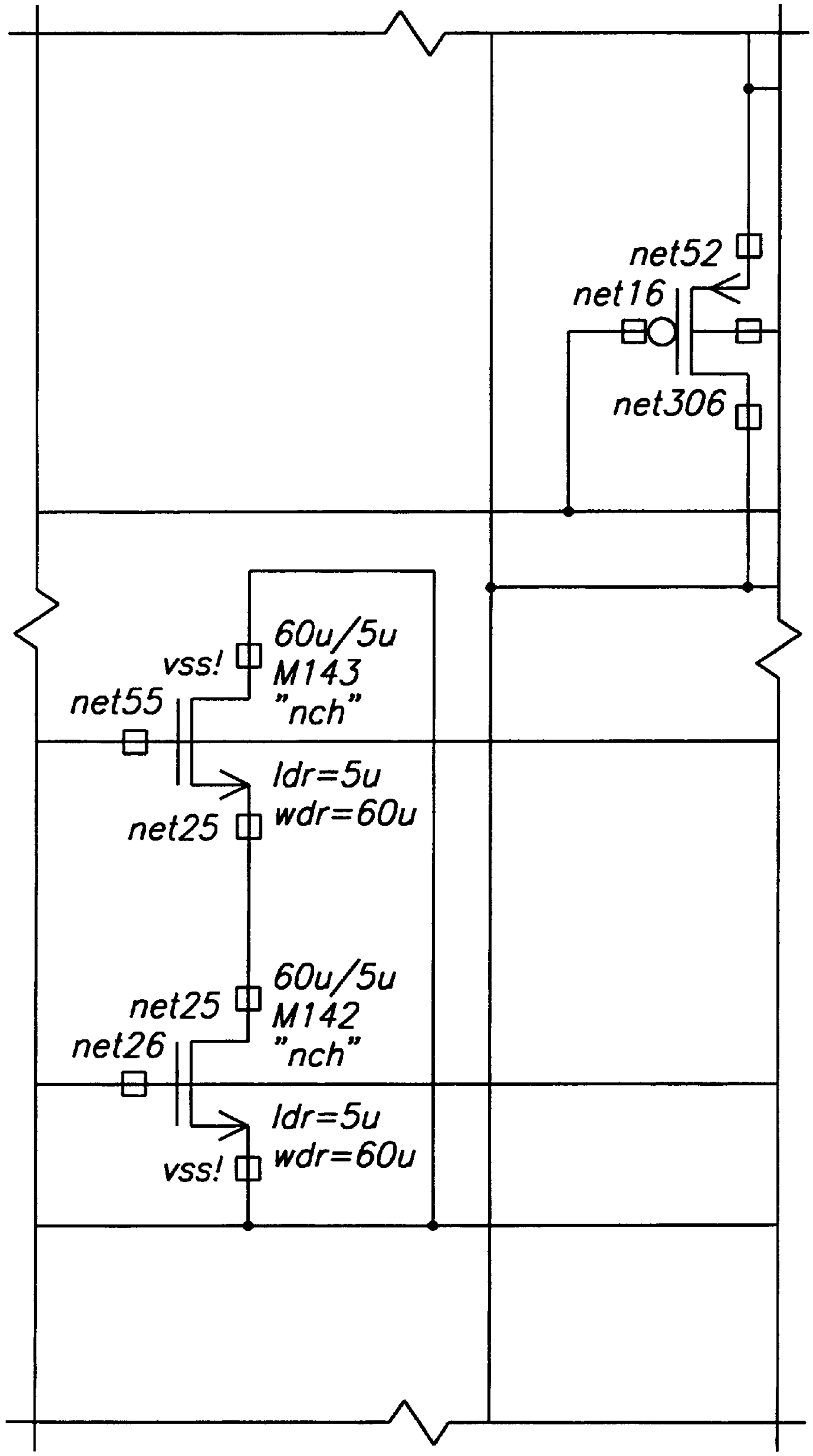
FIG 8.050401BE

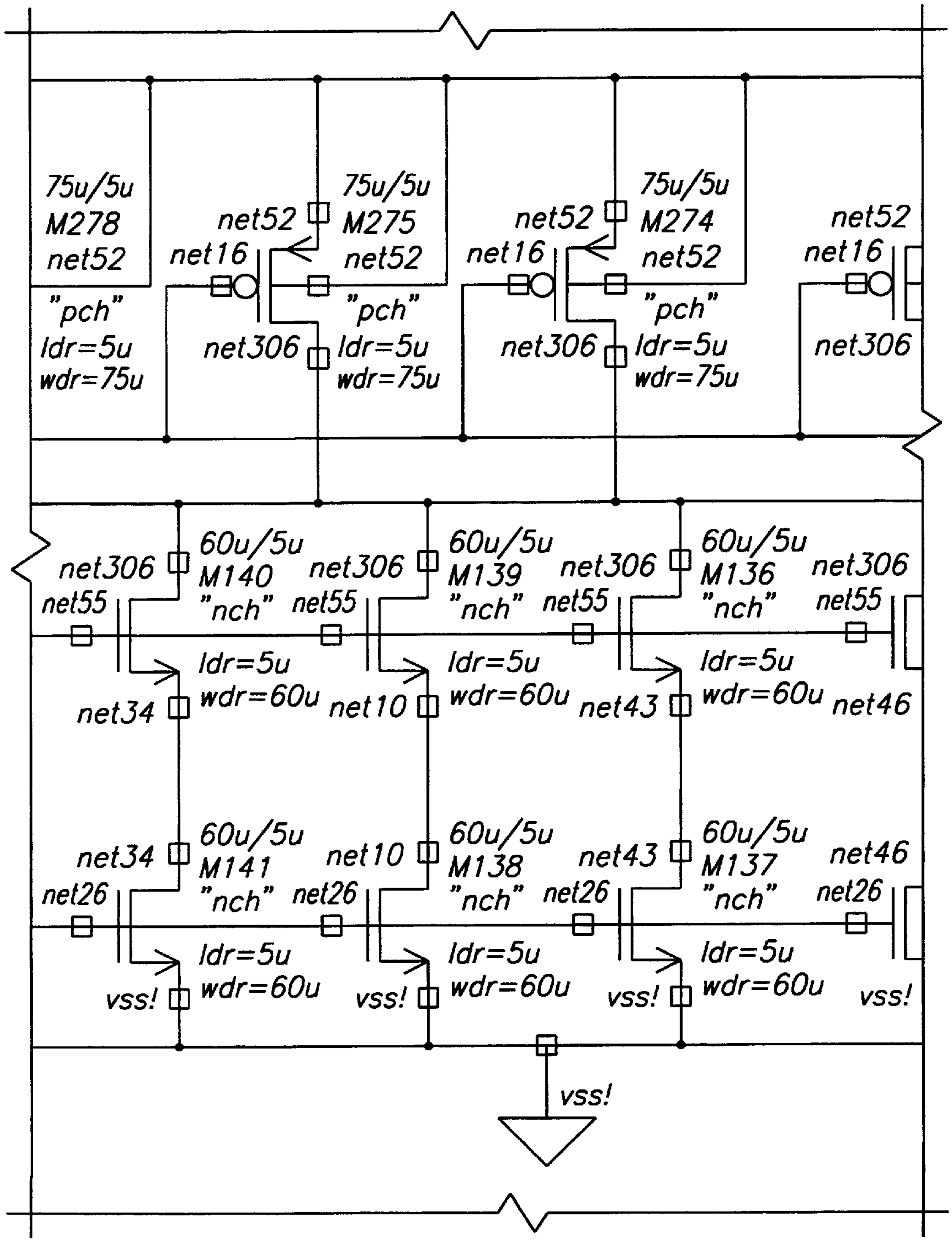
Fig 8.050401BF

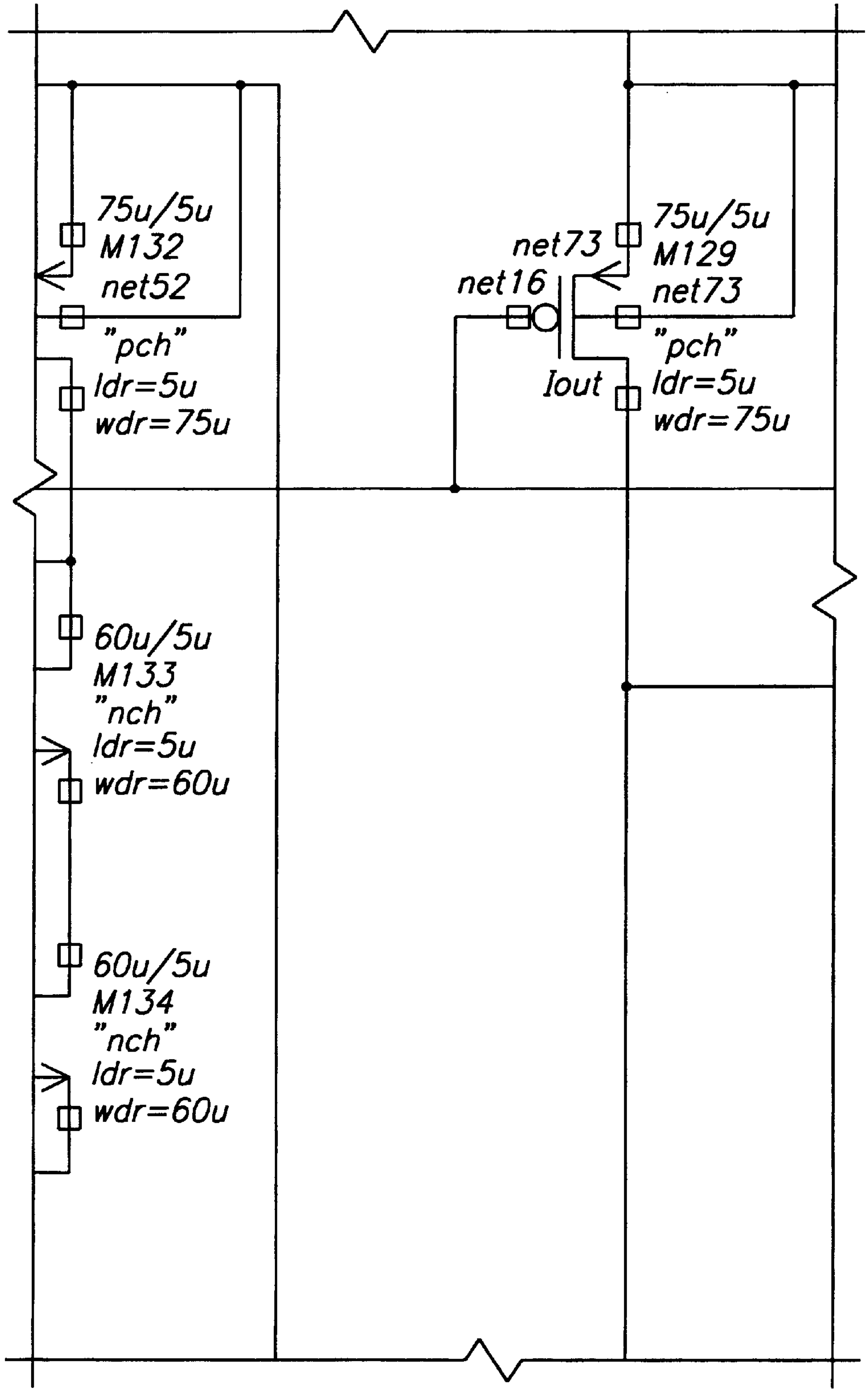
Fig. 8.050401BG

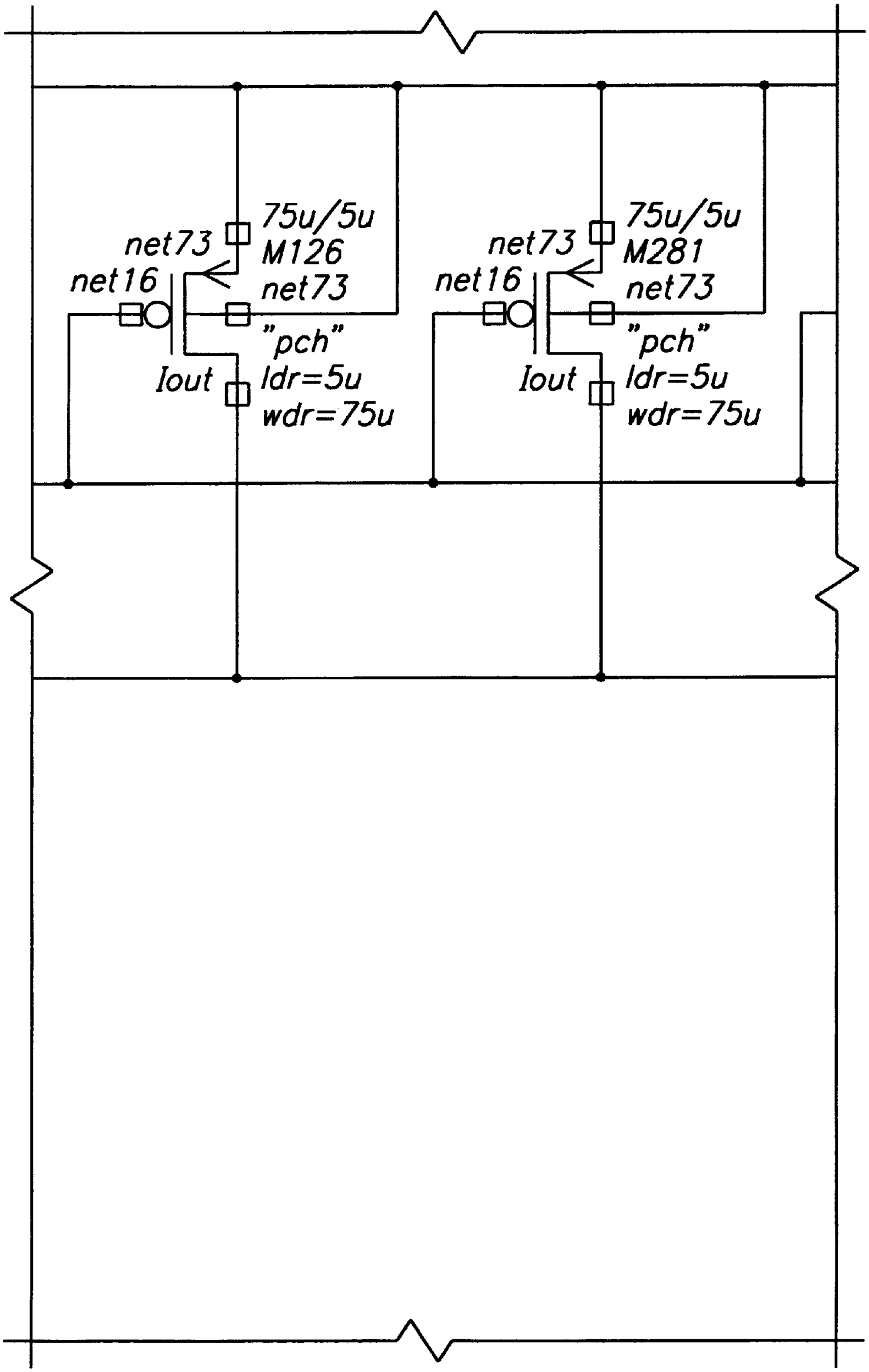
Fig 8.050401BH

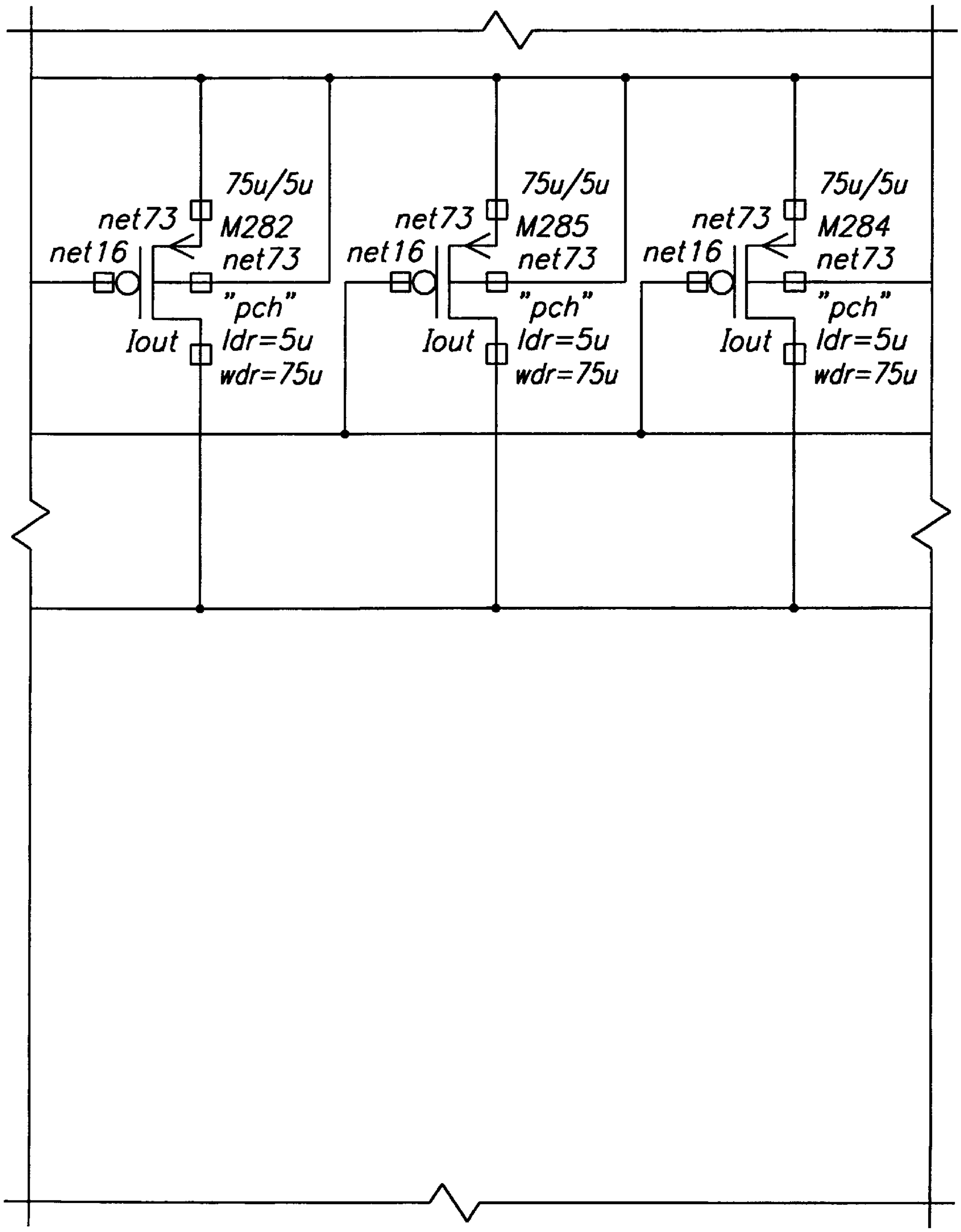
FIG 8.050401B1

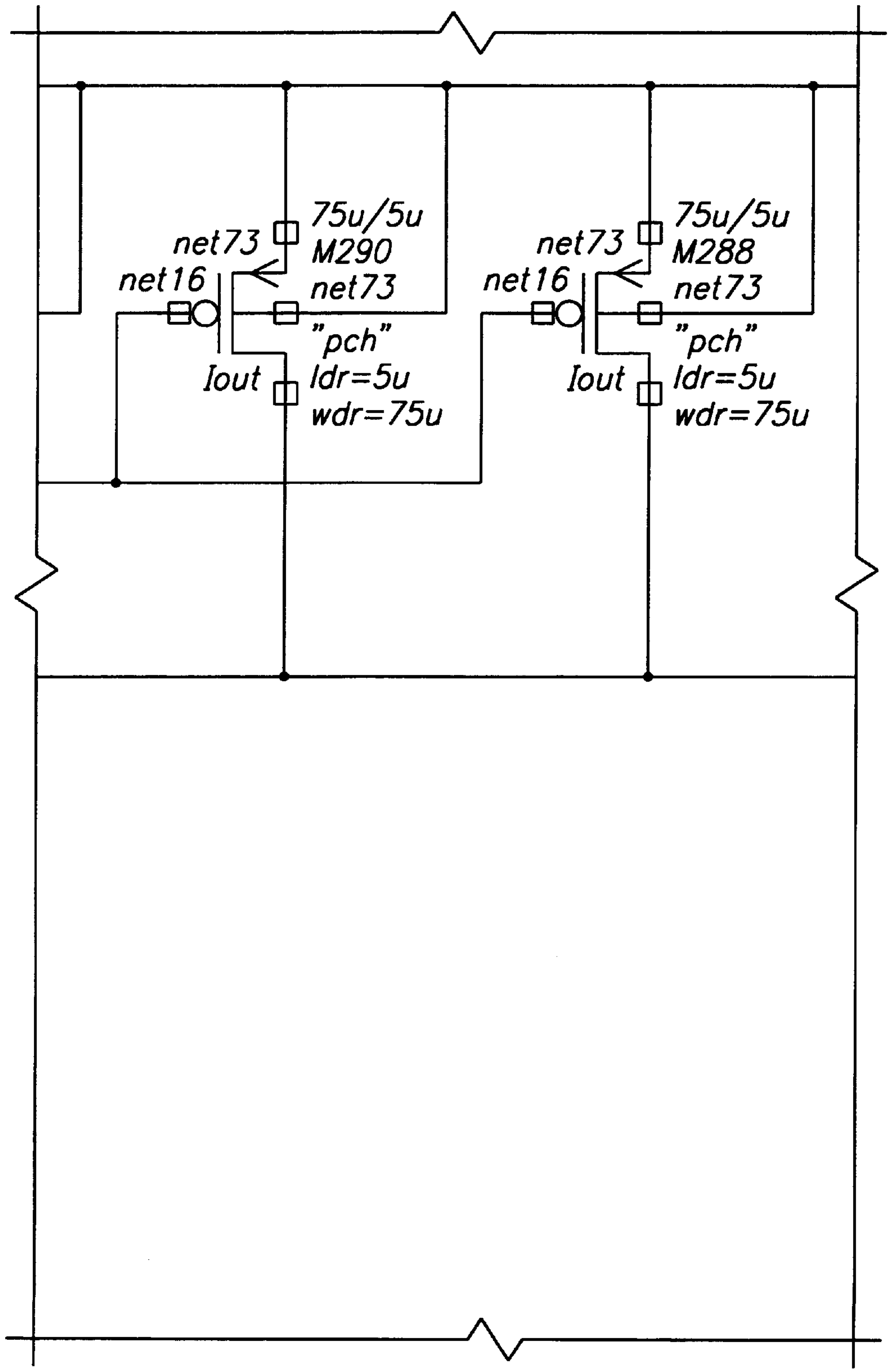
Fig 8.050401B.1

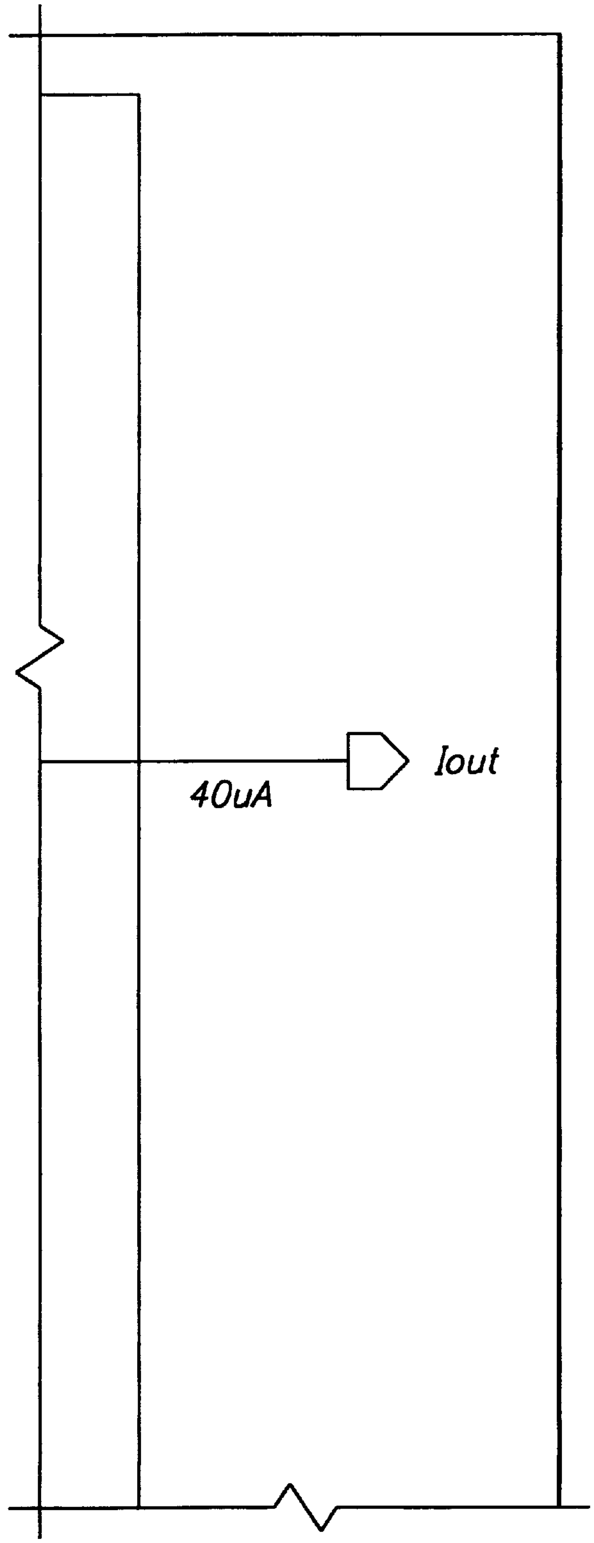
Fig 8.050401BK

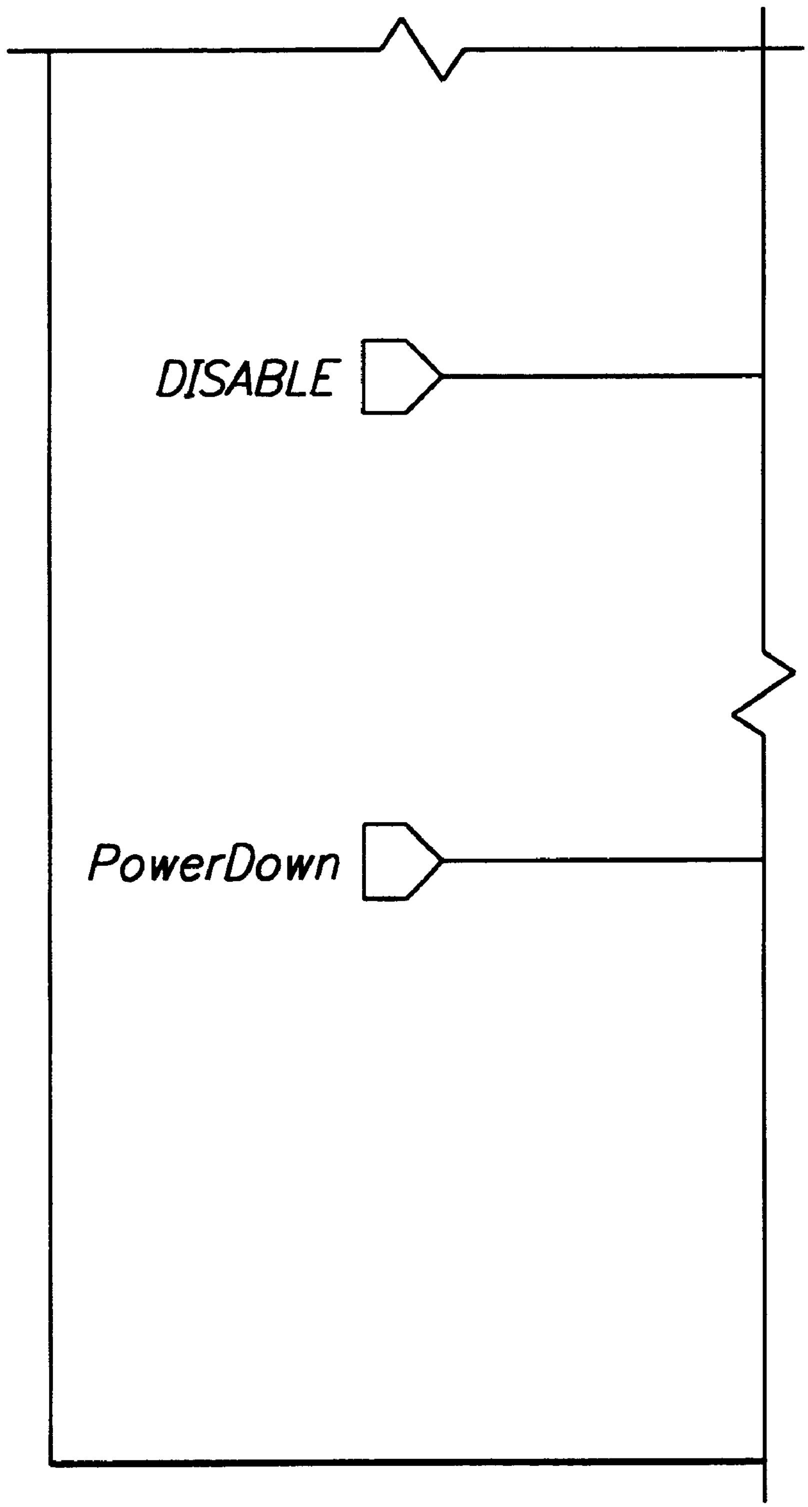
Fig. 8.050401CA

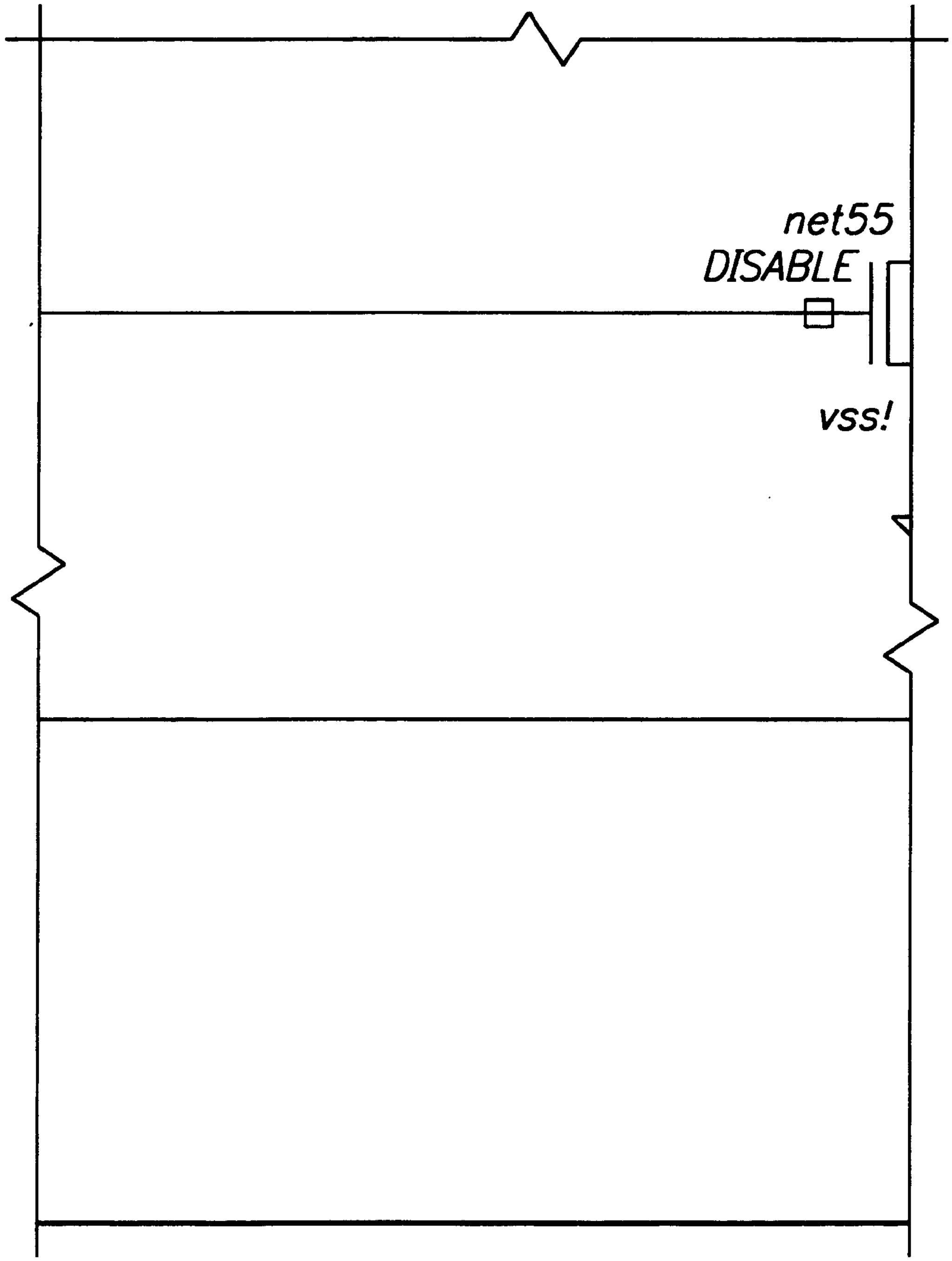
Fig 8.0504.01CB

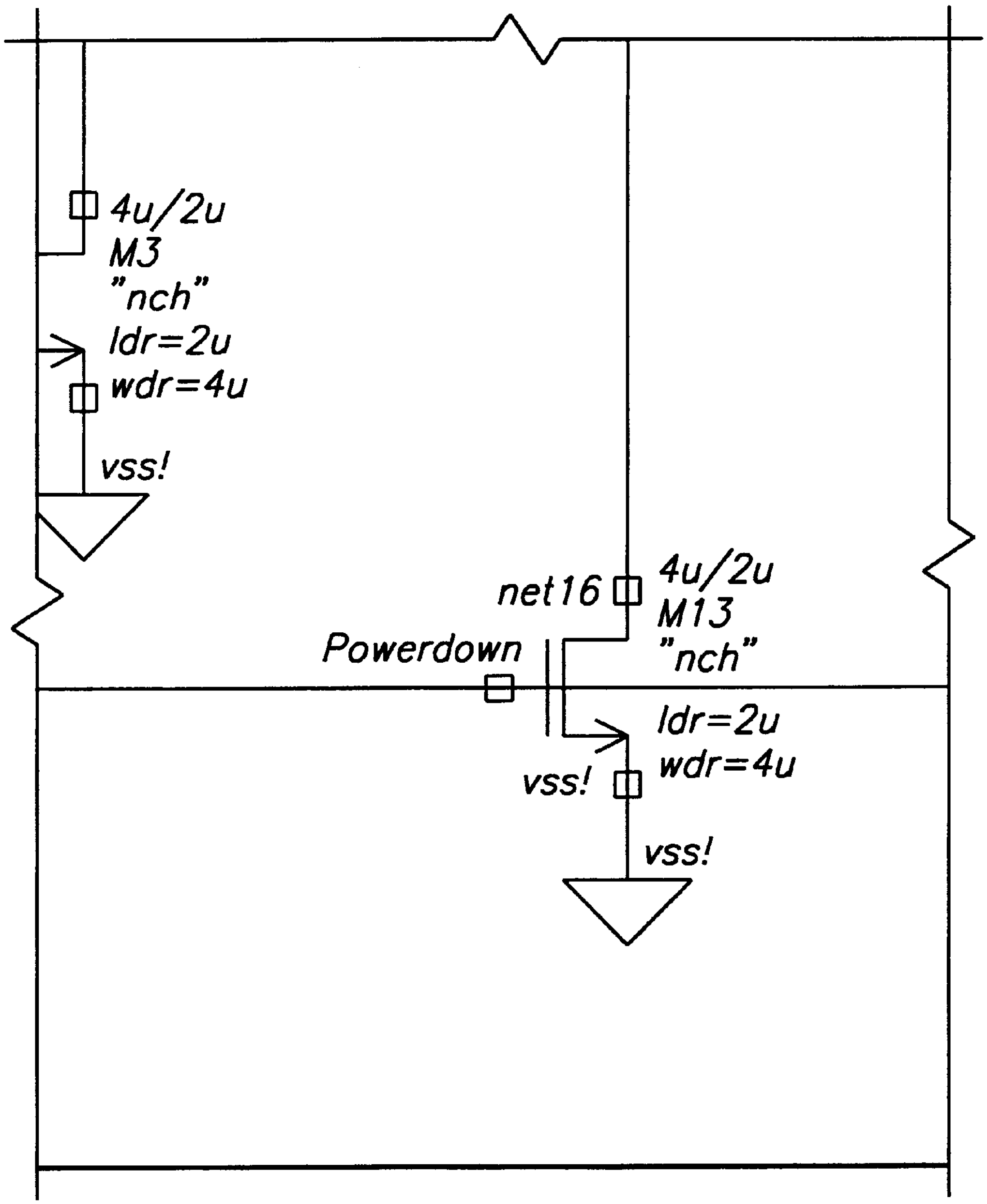
Fig 8.050401CC

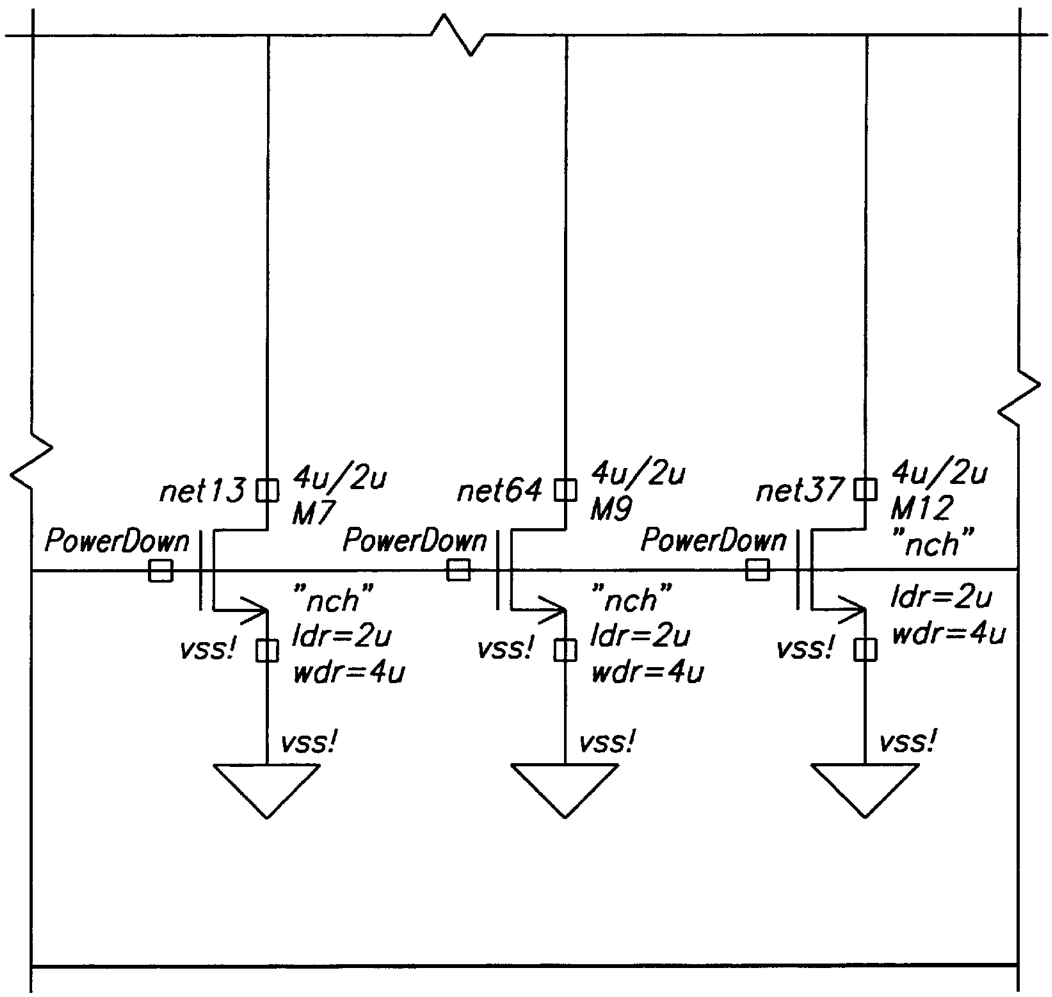
Fig 8.05040ICD

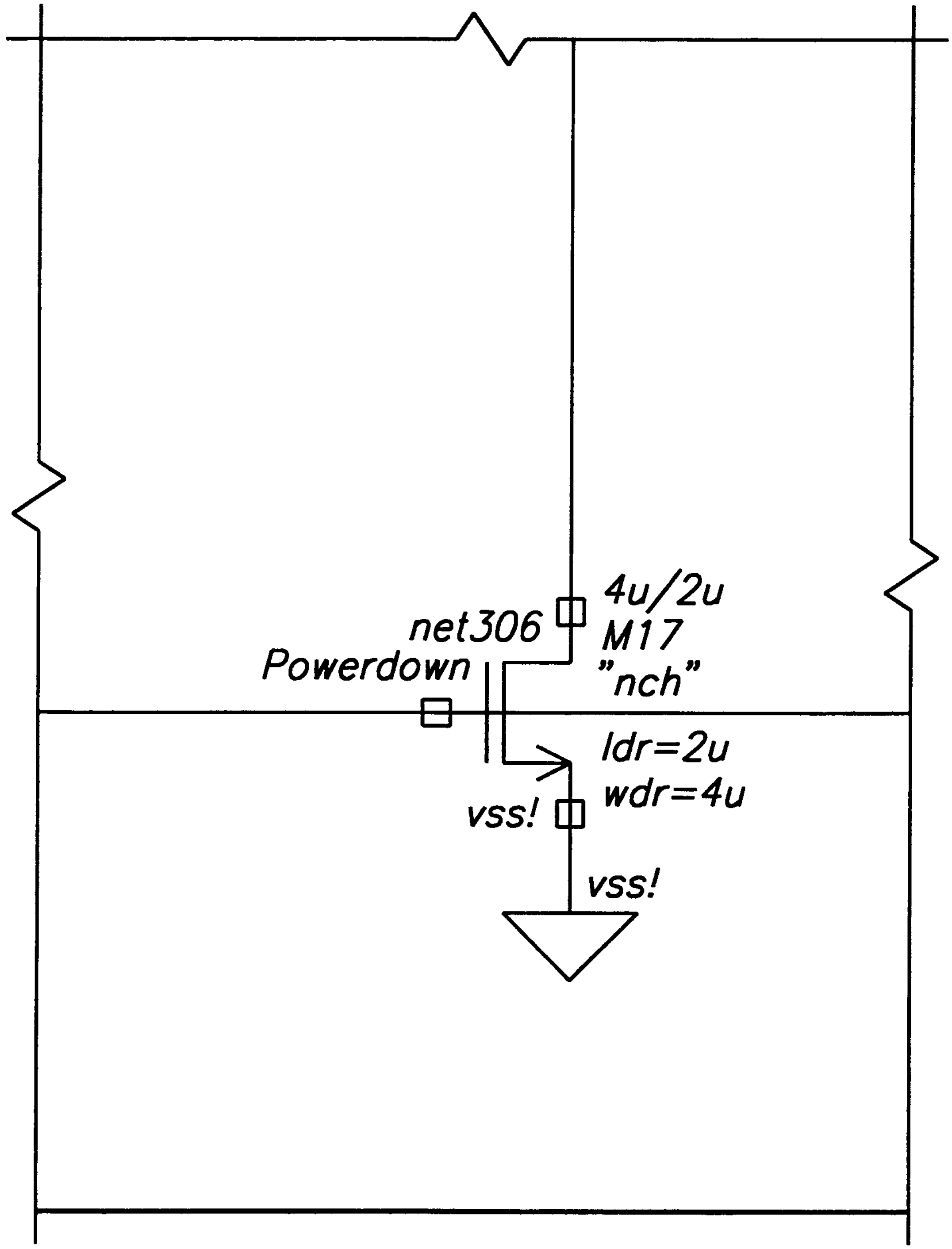
Fig 8.050401CE

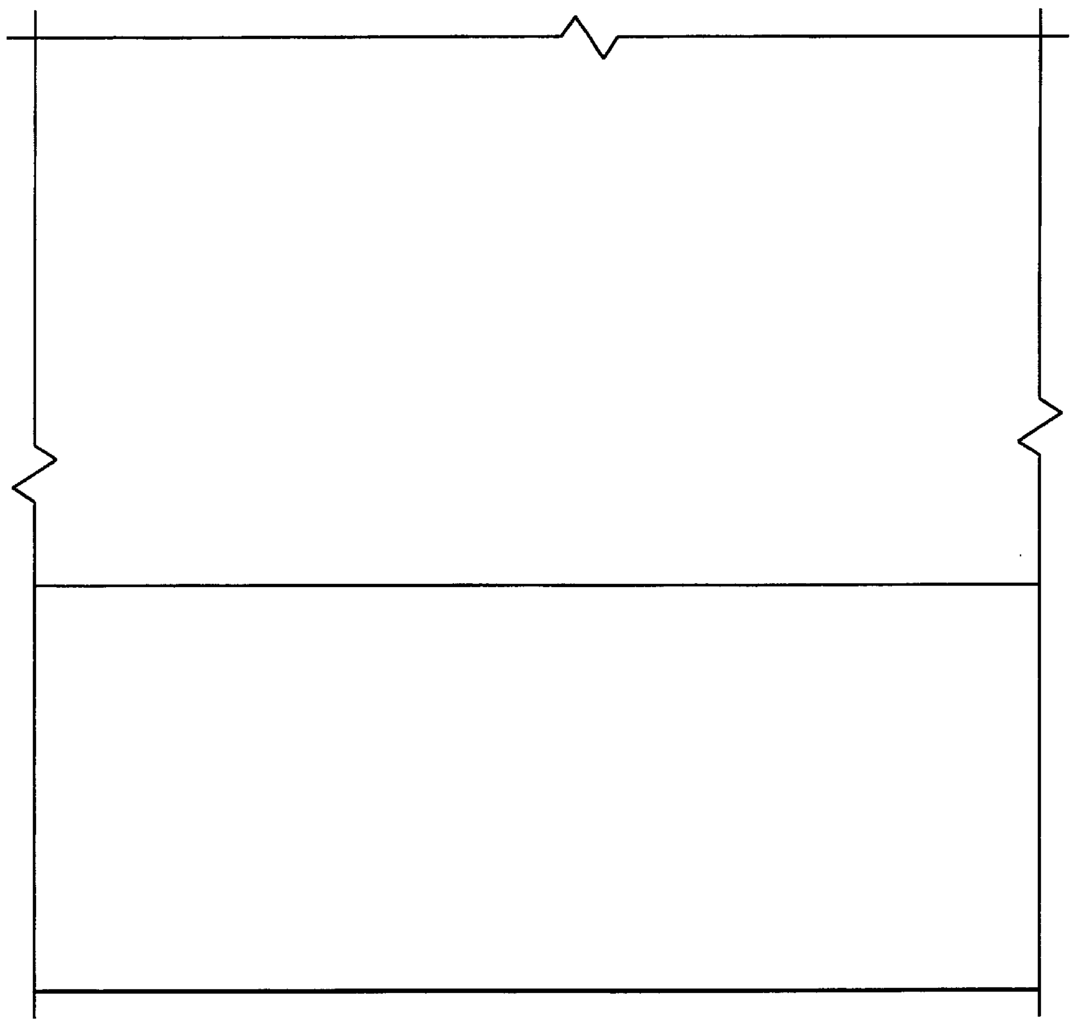
Fig 8.050401CF

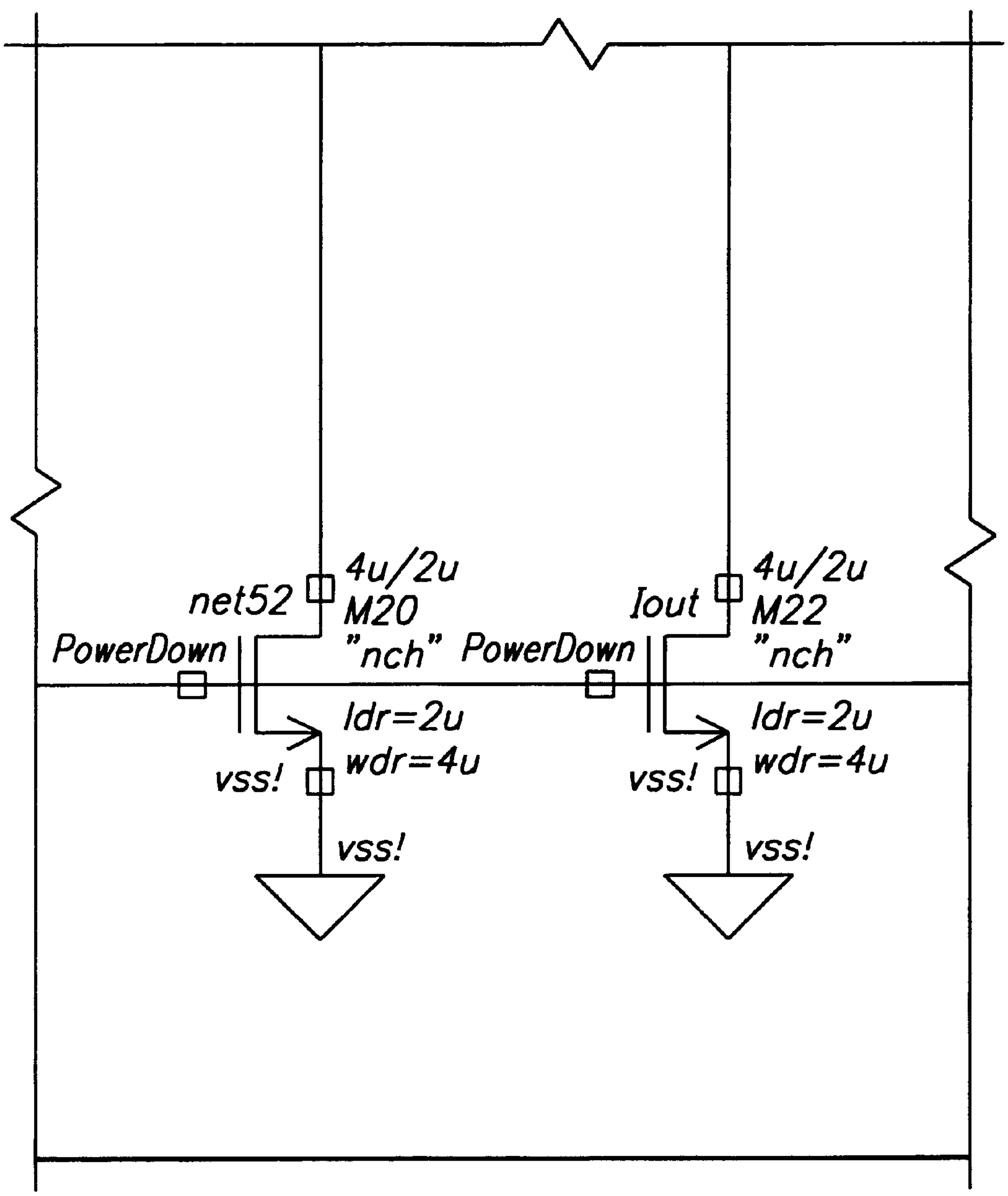
Fig 8.05040ICG

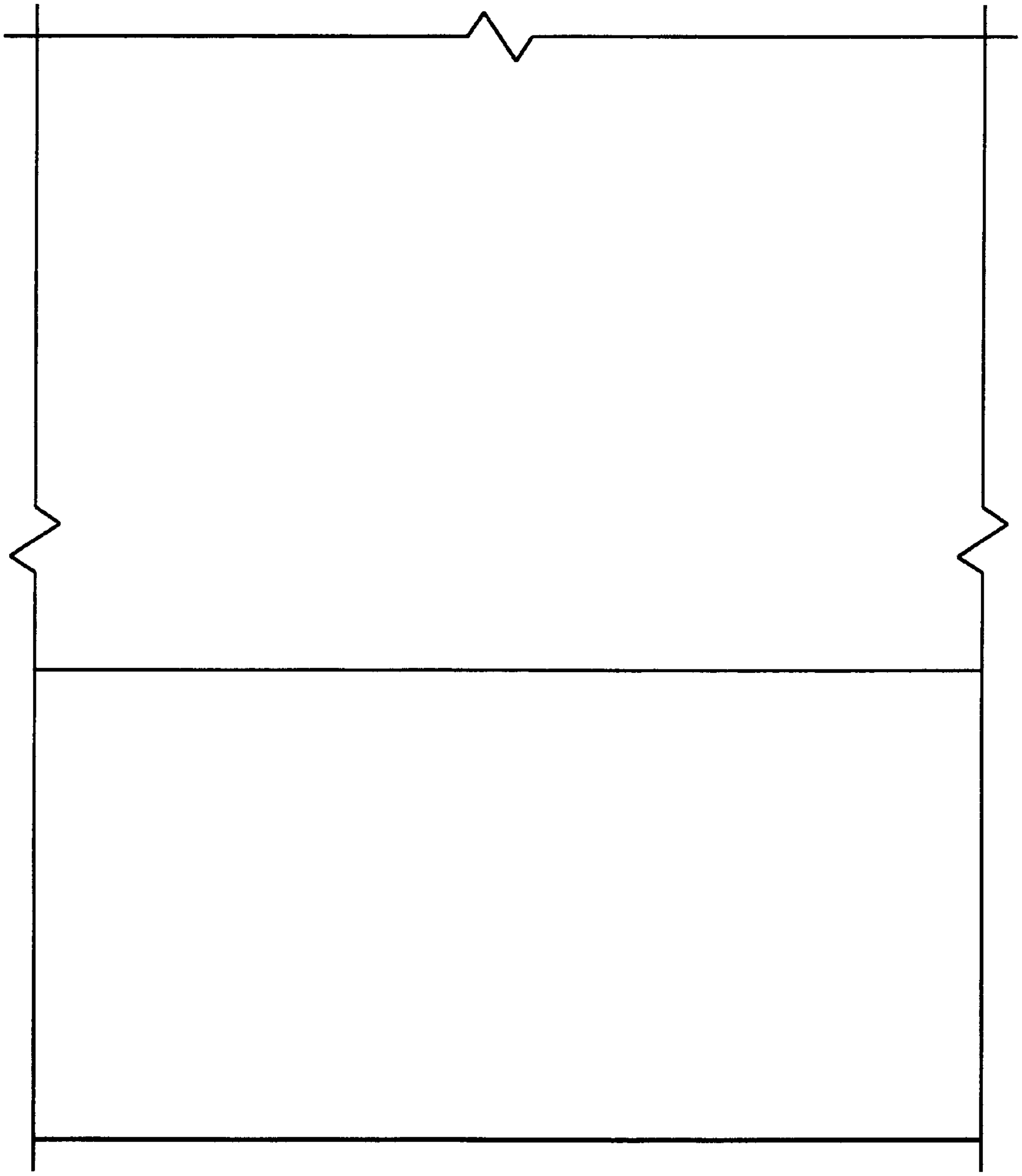
Fig 8.050401CH

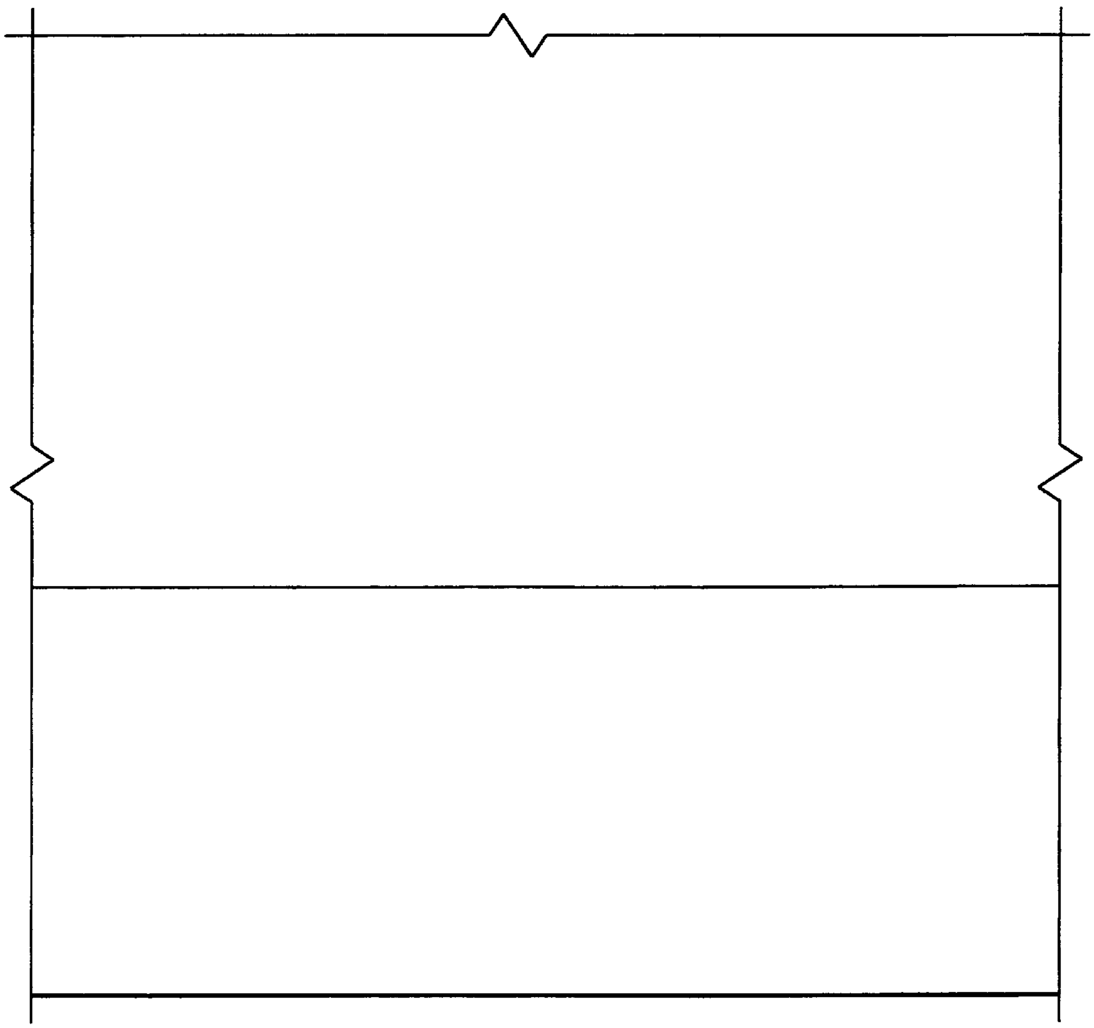
Fig 8.050401CI

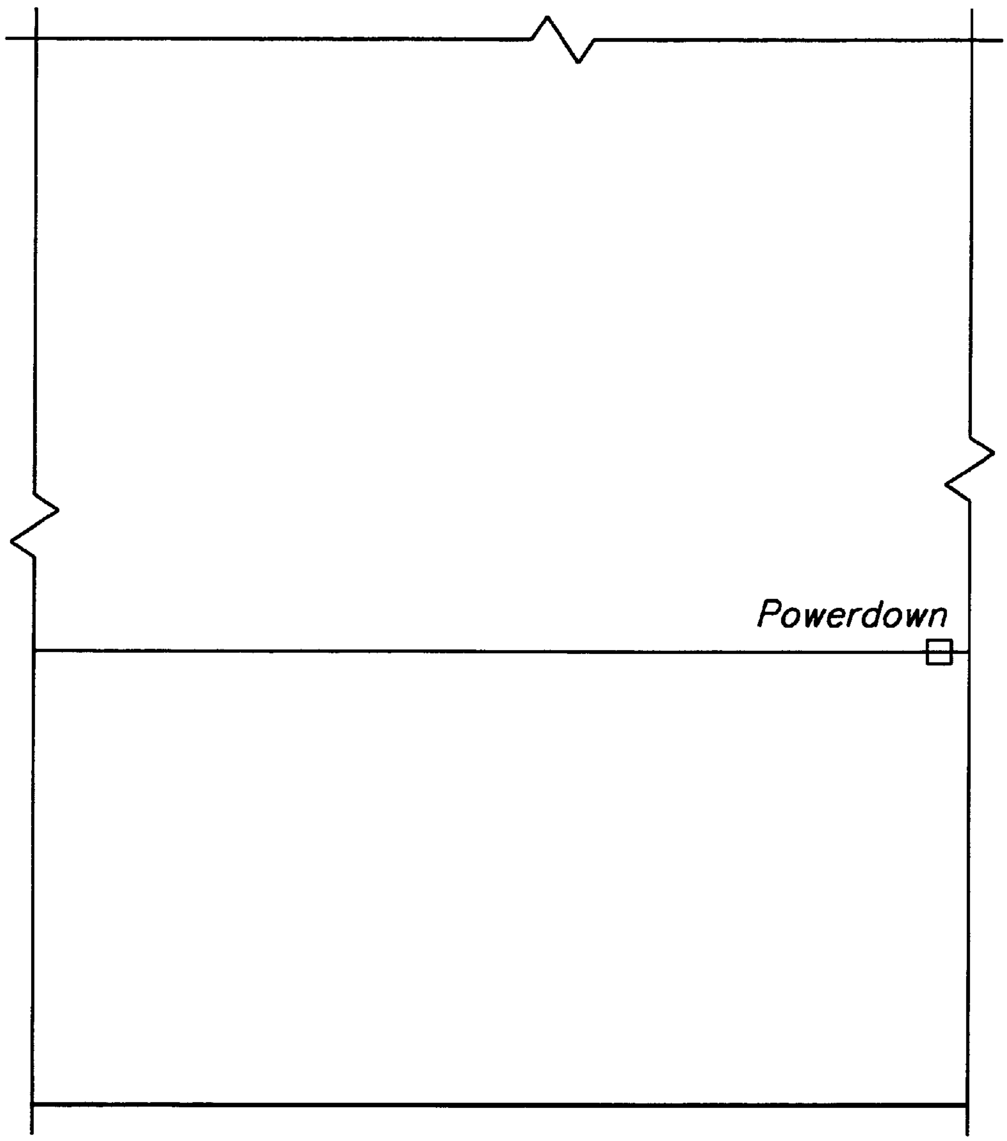
Fig. 8.050401Cd

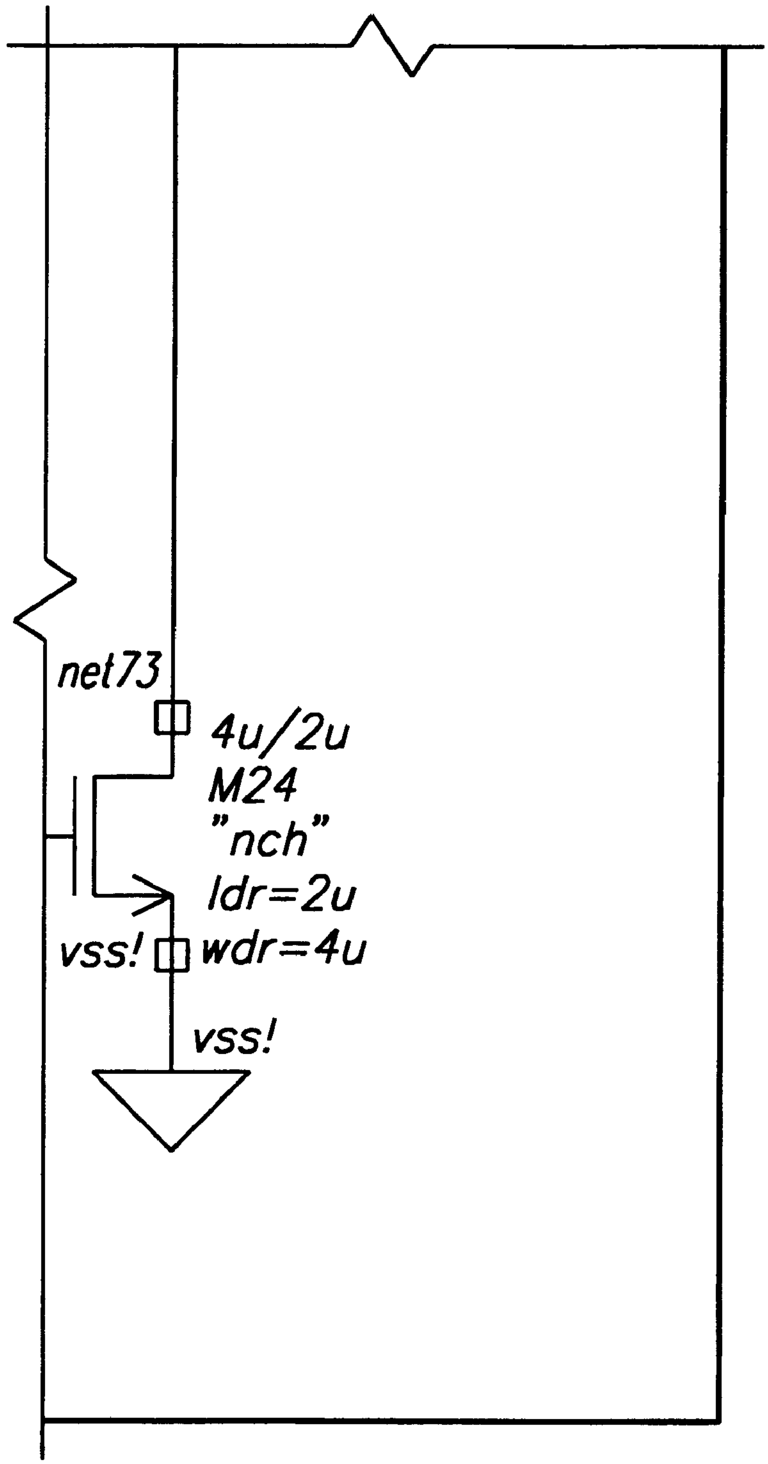
FIG 8.0504.01CK

| | | | | | | | | | |
|---|---|---|---|---|---|---|---|---|---|
| 8.050402AA | 8.050402AB | 8.050402AC | 8.050402AD | 8.050402AE | 8.050402AF | 8.050402AG | 8.050402AH | 8.050402AI | 8.050402AJ |
| 8.050402BA | 8.050402BB | 8.050402BC | 8.050402BD | 8.050402BE | 8.050402BF | 8.050402BG | 8.050402BH | 8.050402BI | 8.050402BJ |
| 8.050402CA | 8.050402CB | 8.050402CC | 8.050402CD | 8.050402CE | 8.05040CF | 8.050402CG | 8.050402CH | 8.050402CI | 8.050402CJ |

Fig 8.050402

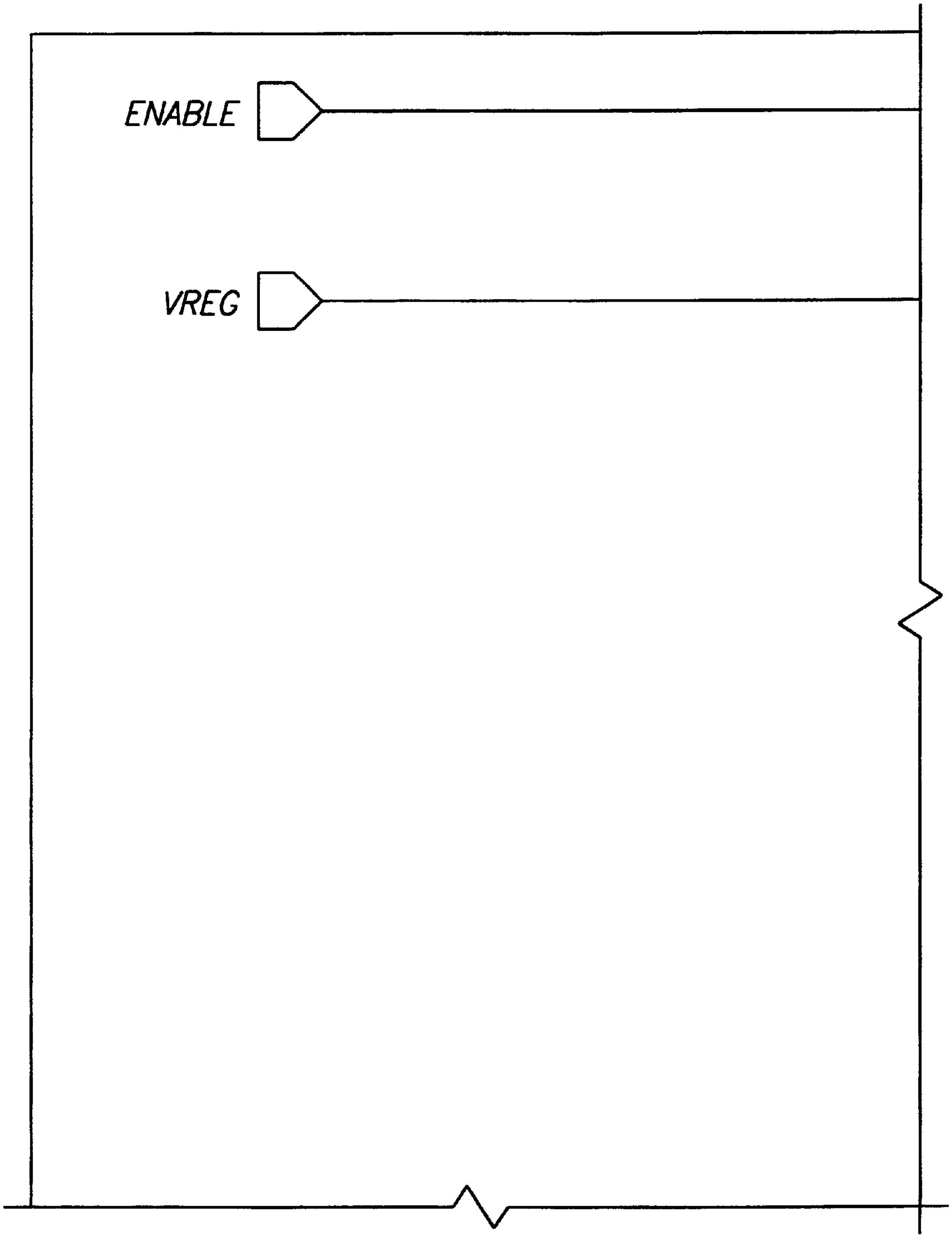
Fig 8.05040 2AA

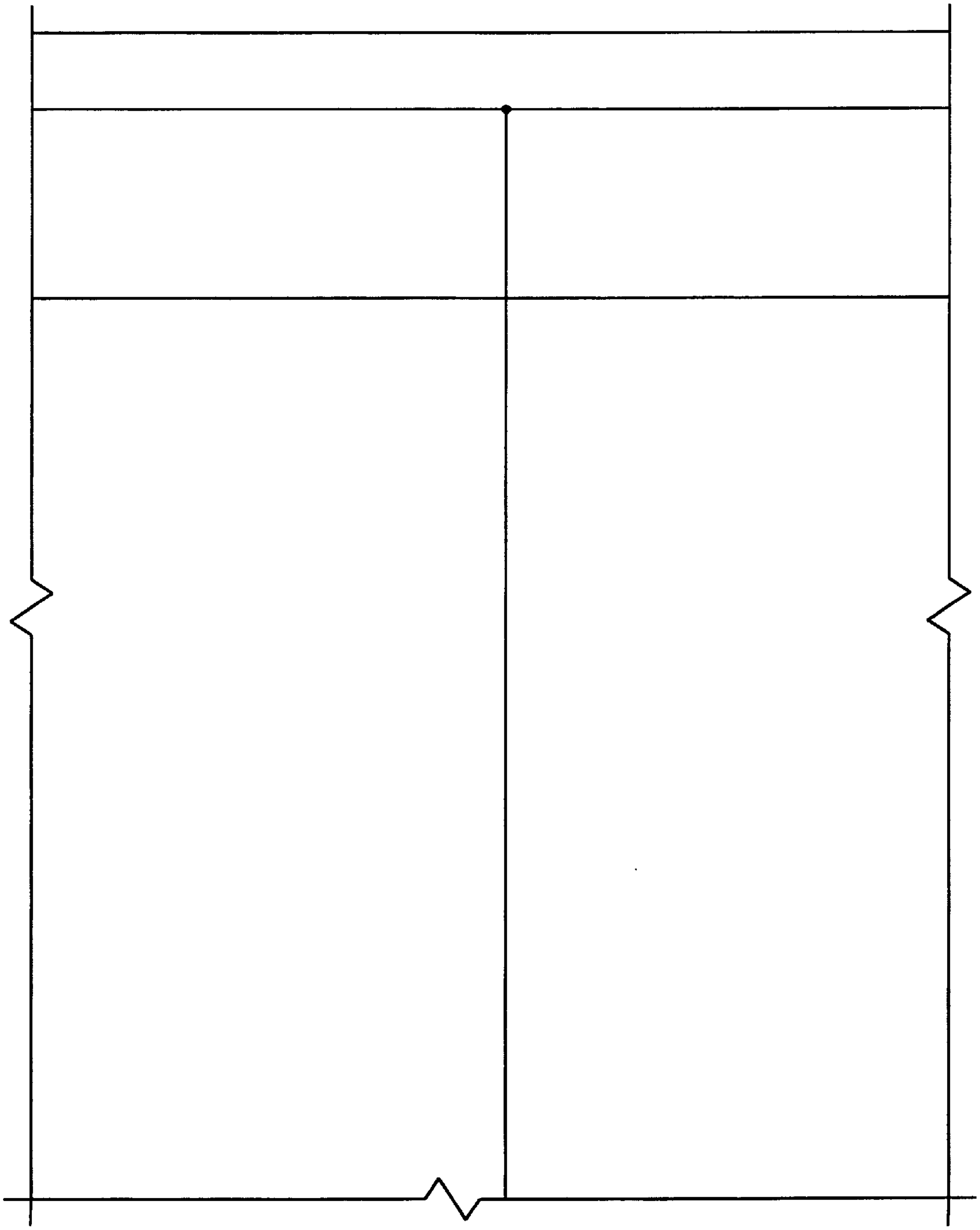
Fig 8.050402AB

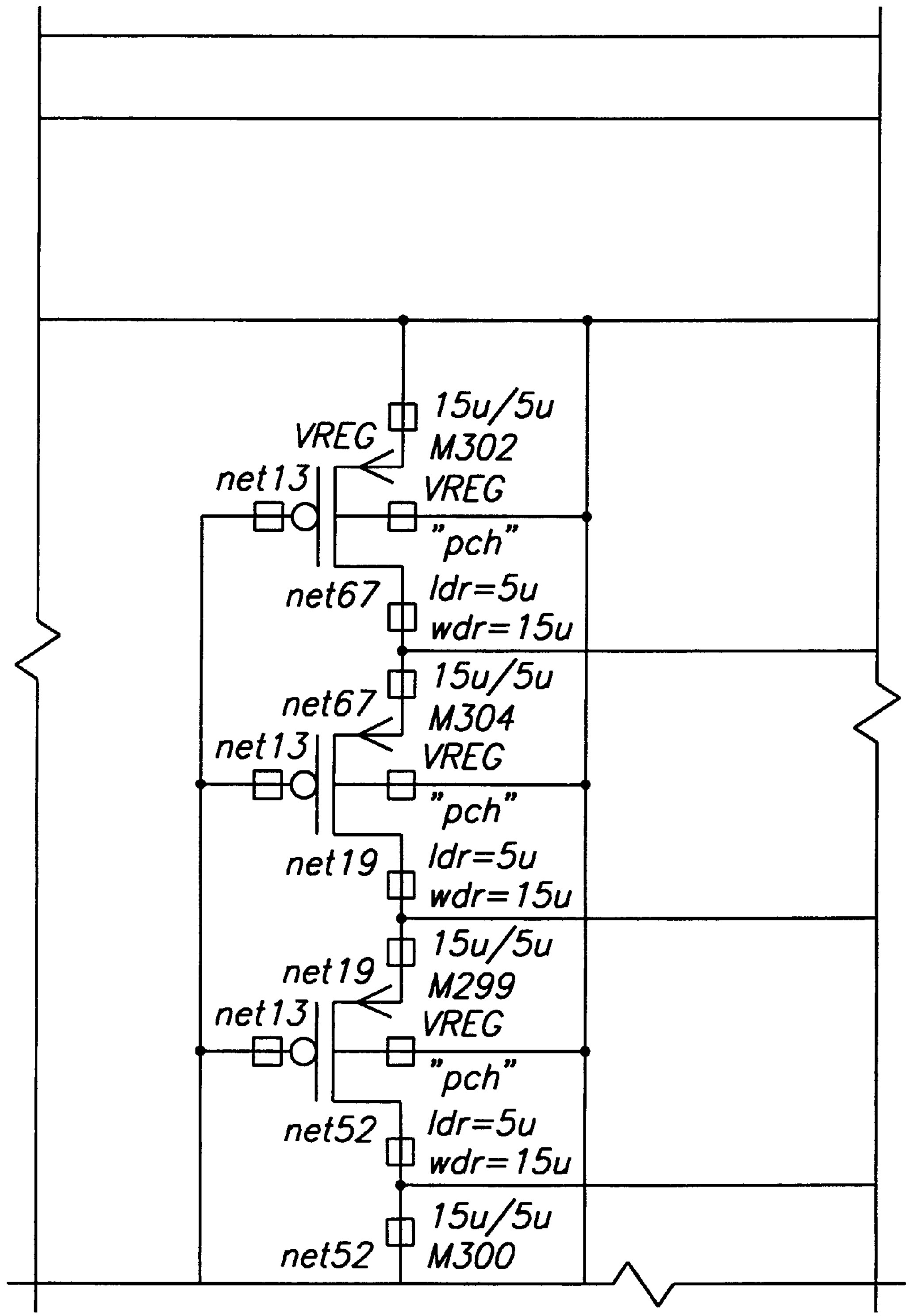
Fig 8.050402AC

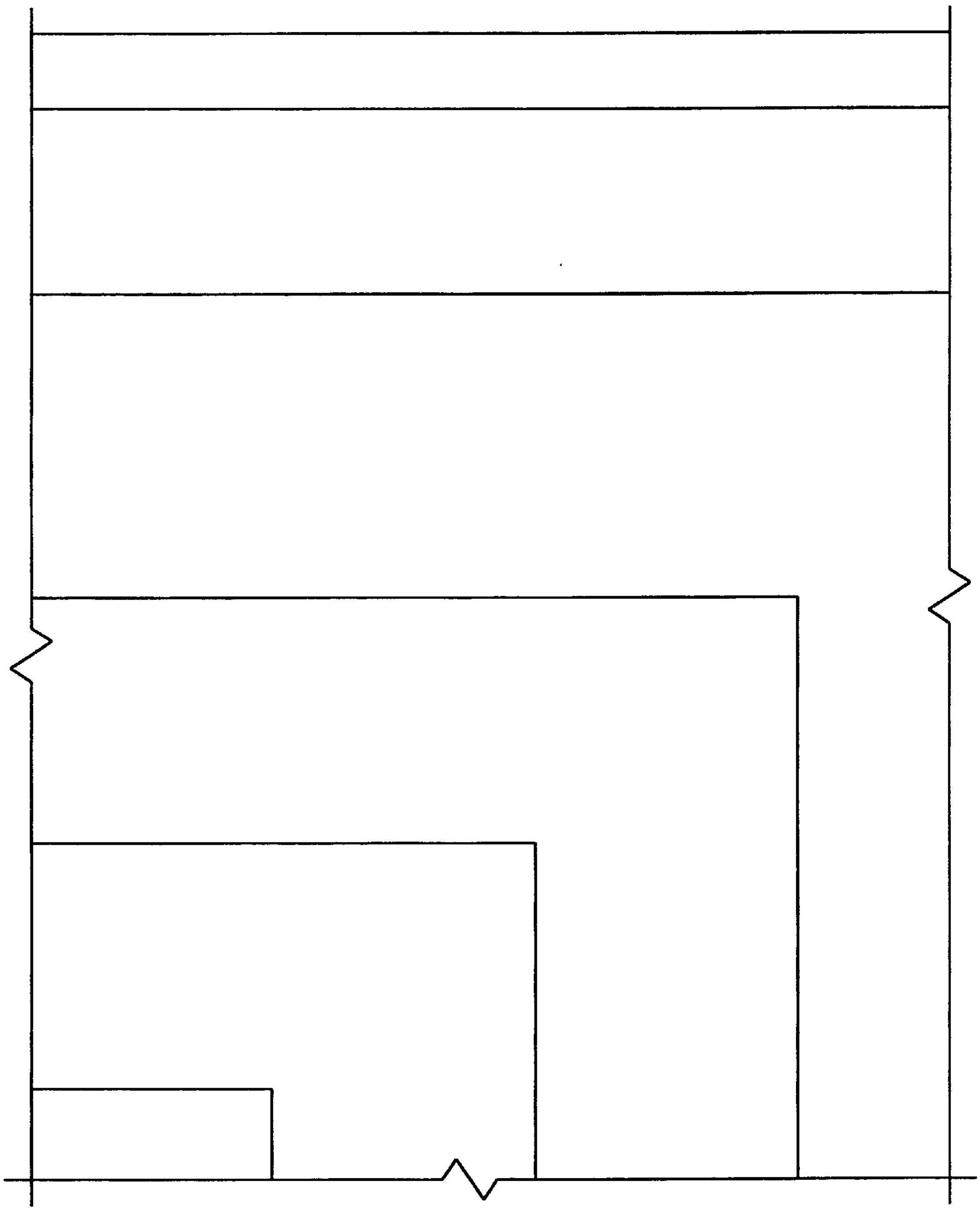
Fig 8.050402AD

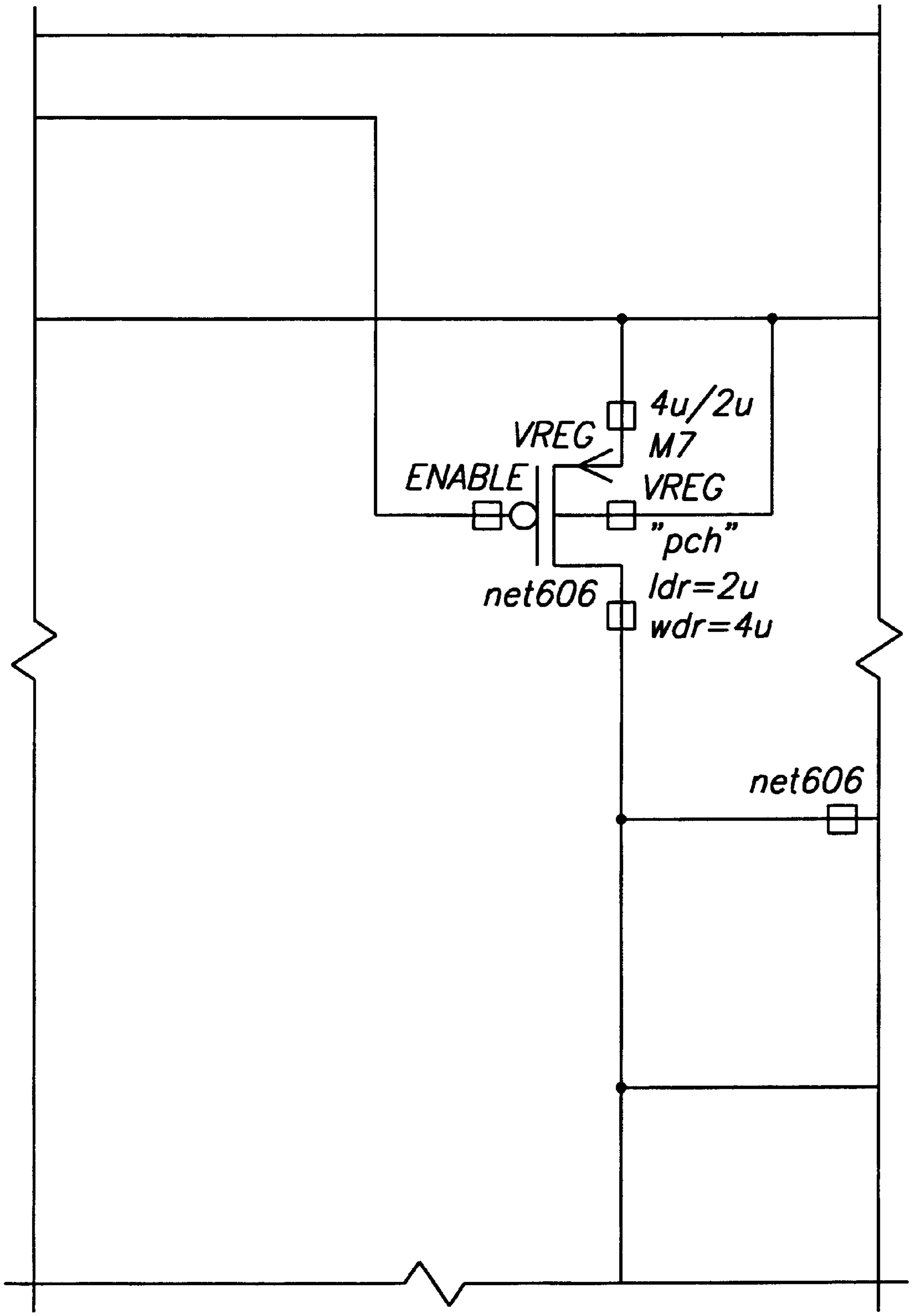
Fig 8.05O4O2AE

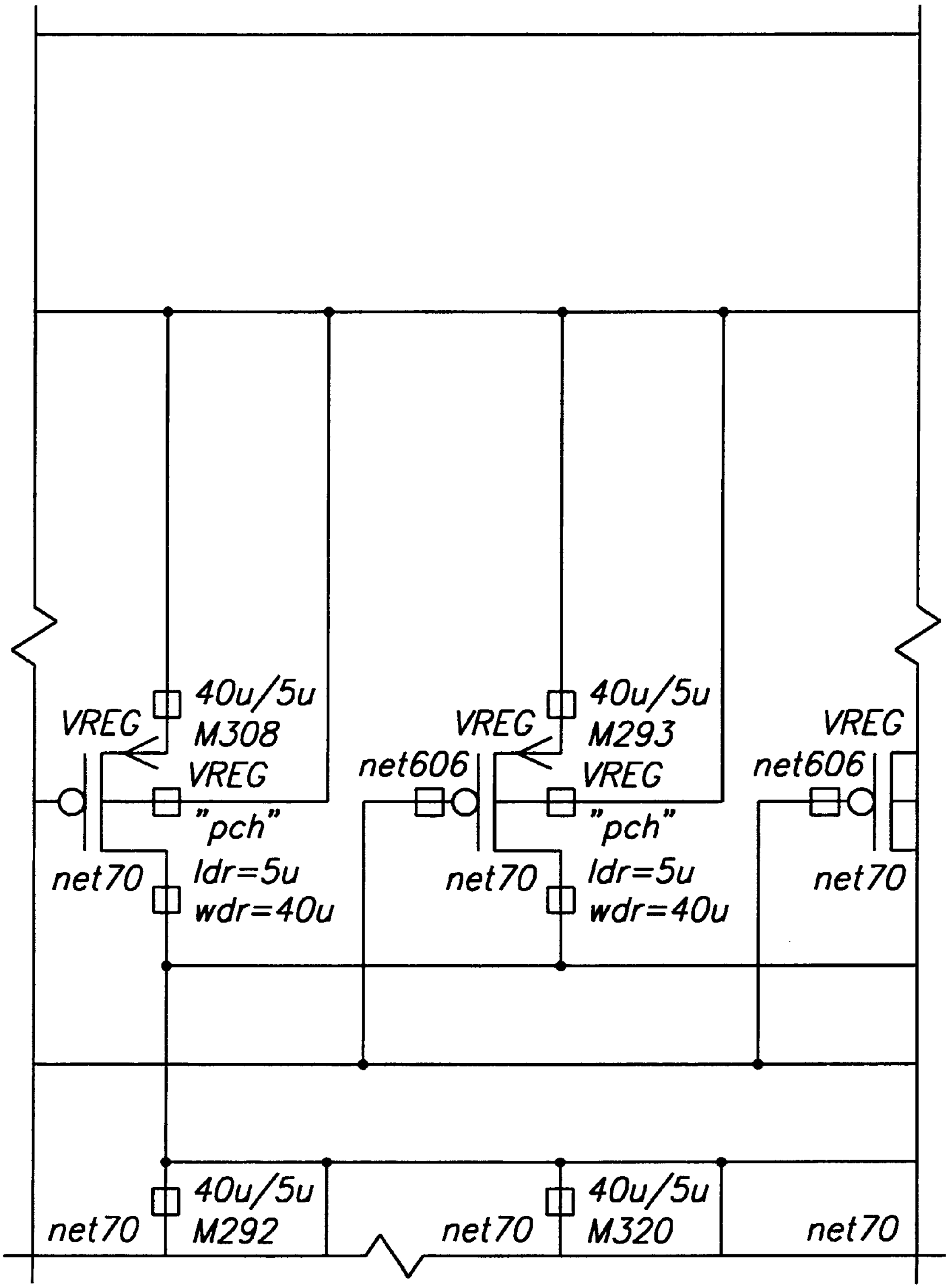
Fig 8.050402AF

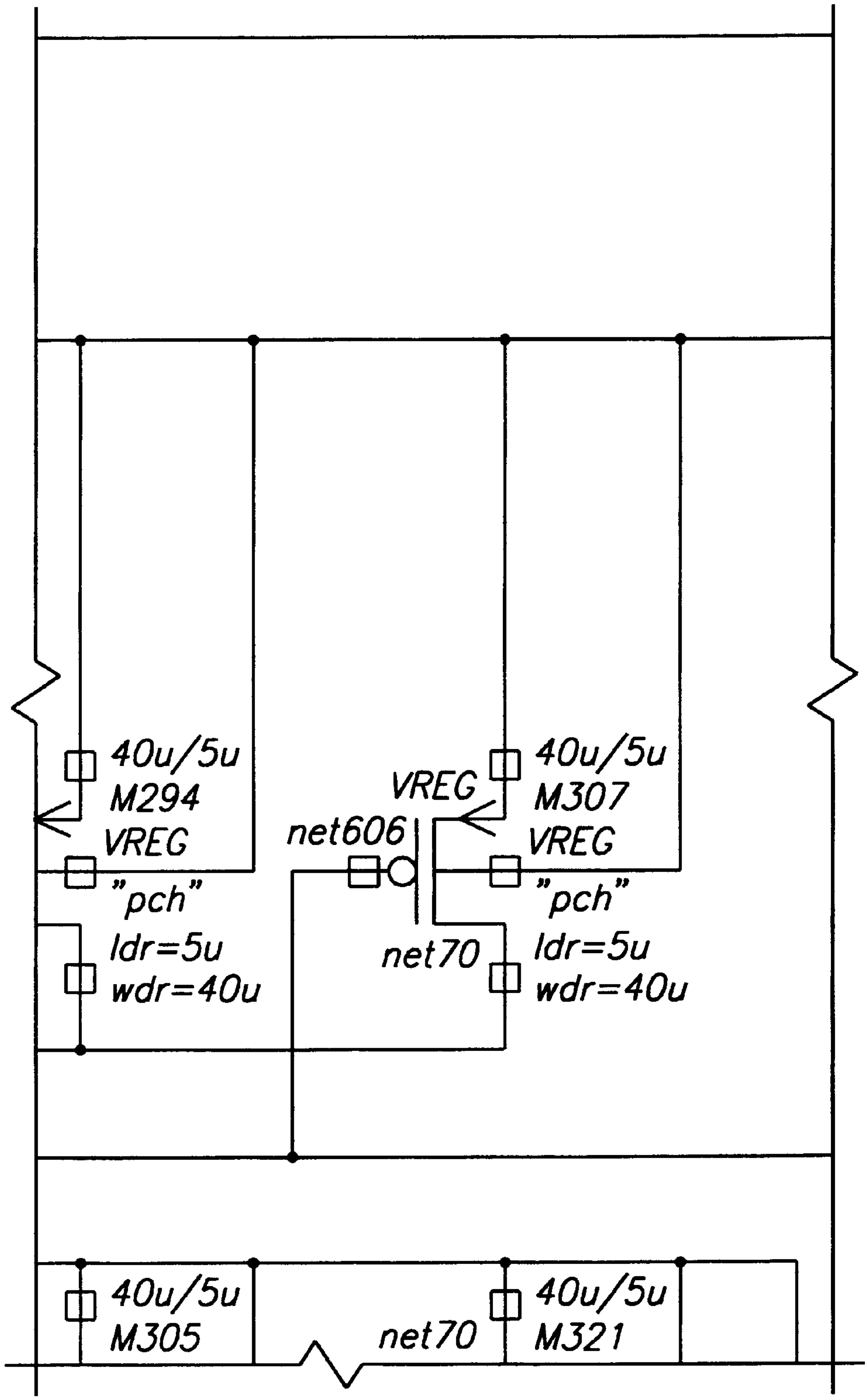
Fig 8.050402AG

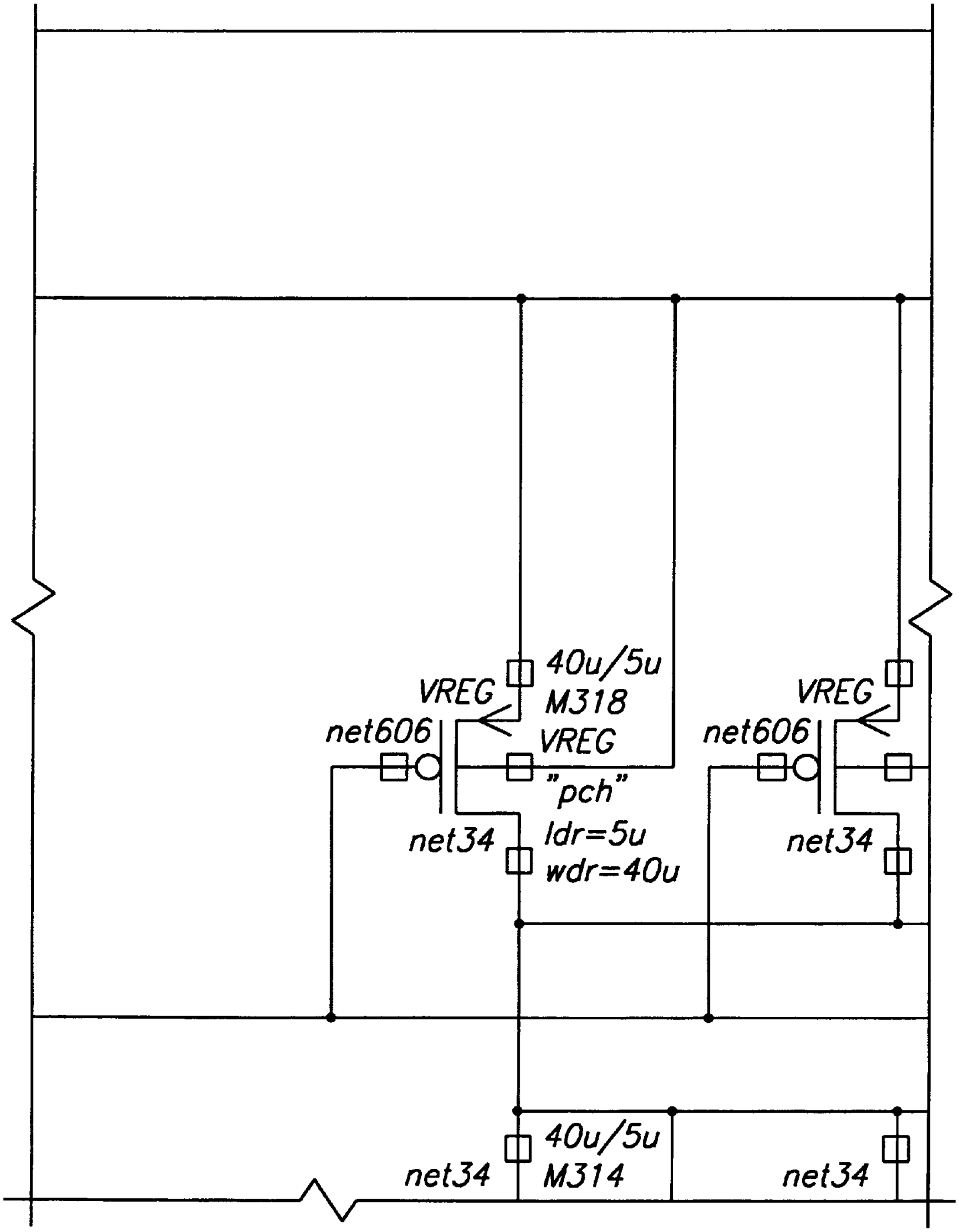
Fig 8.05040.2AH

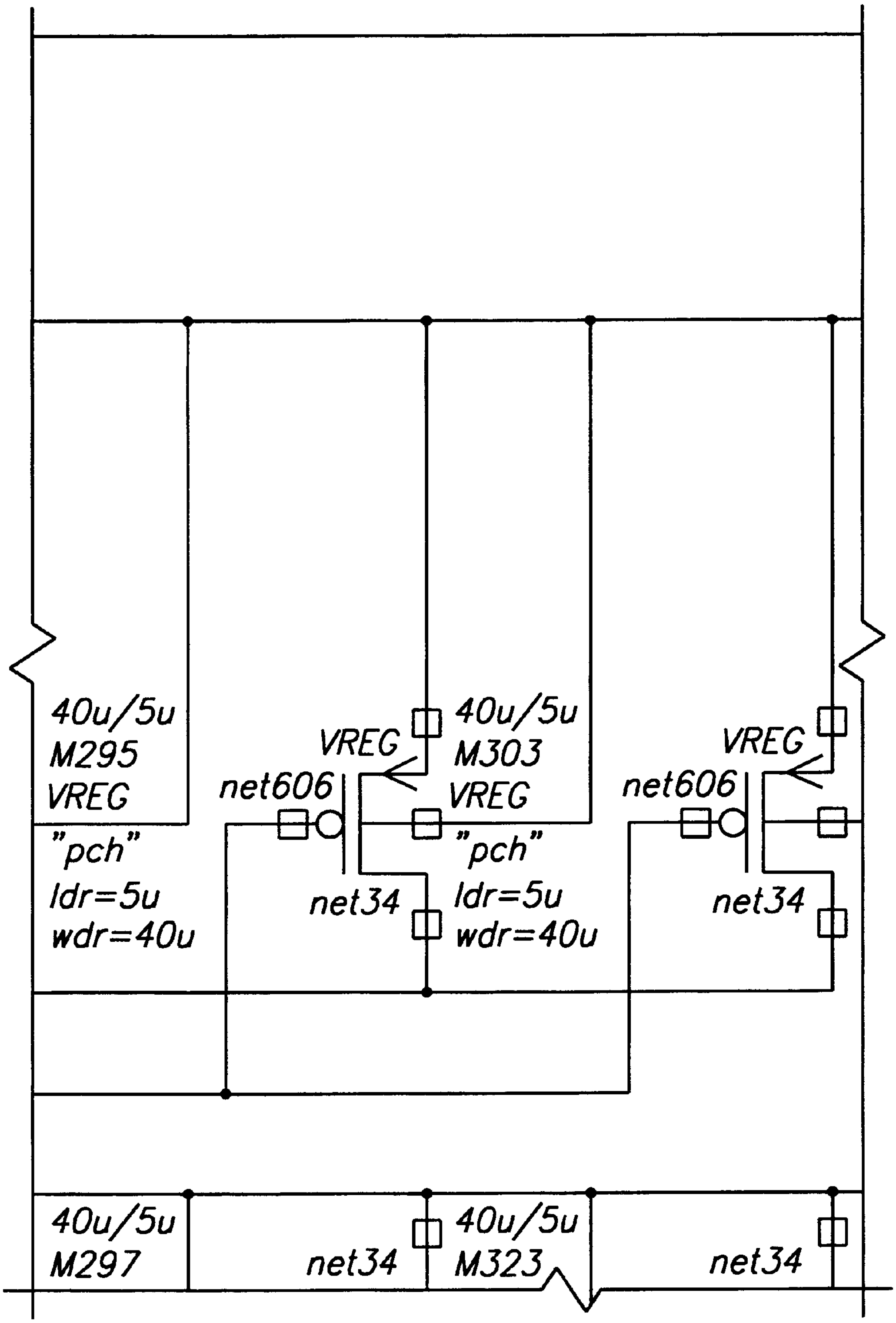
Fig 8.050402AI

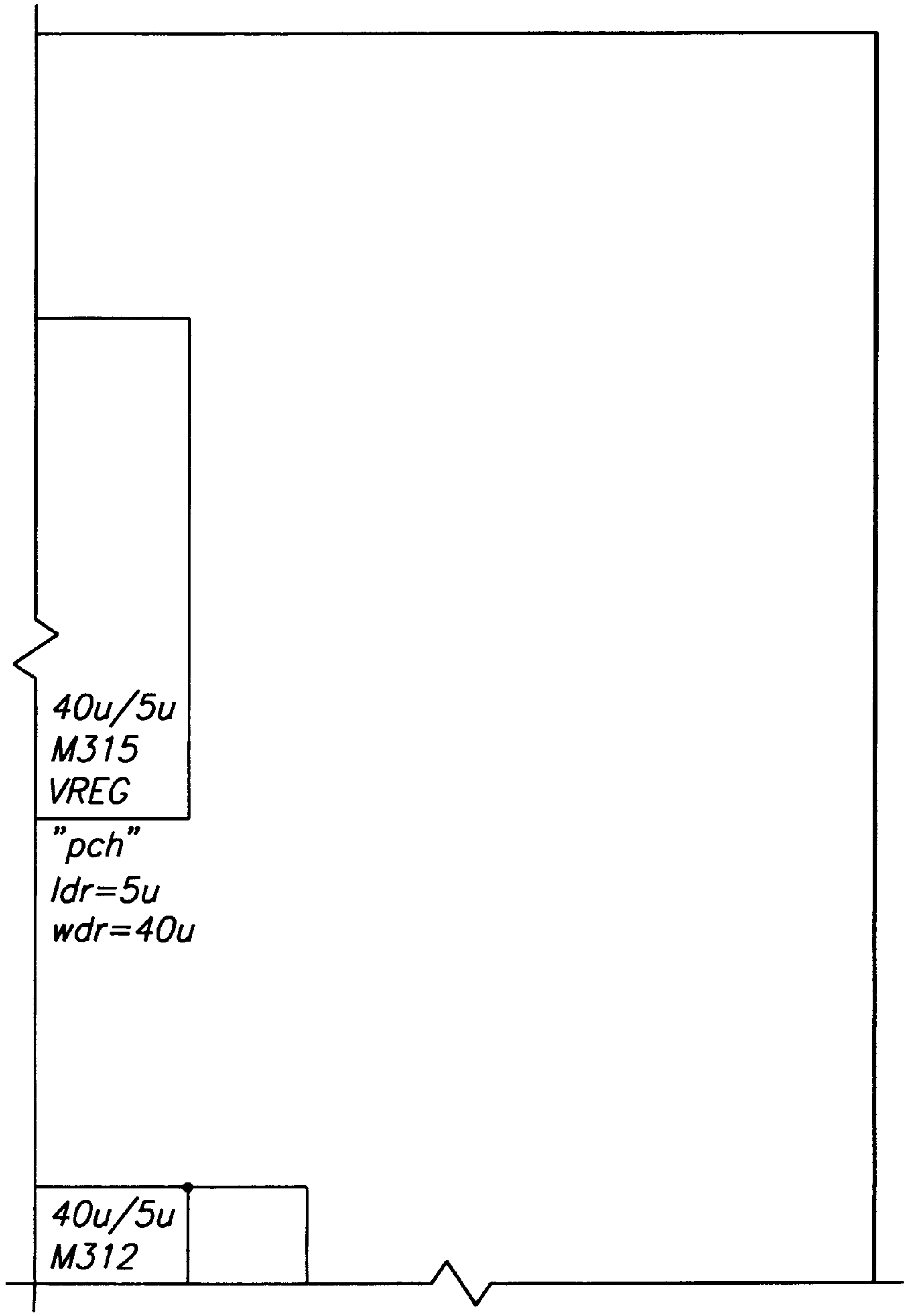
Fig 8.050402A.1

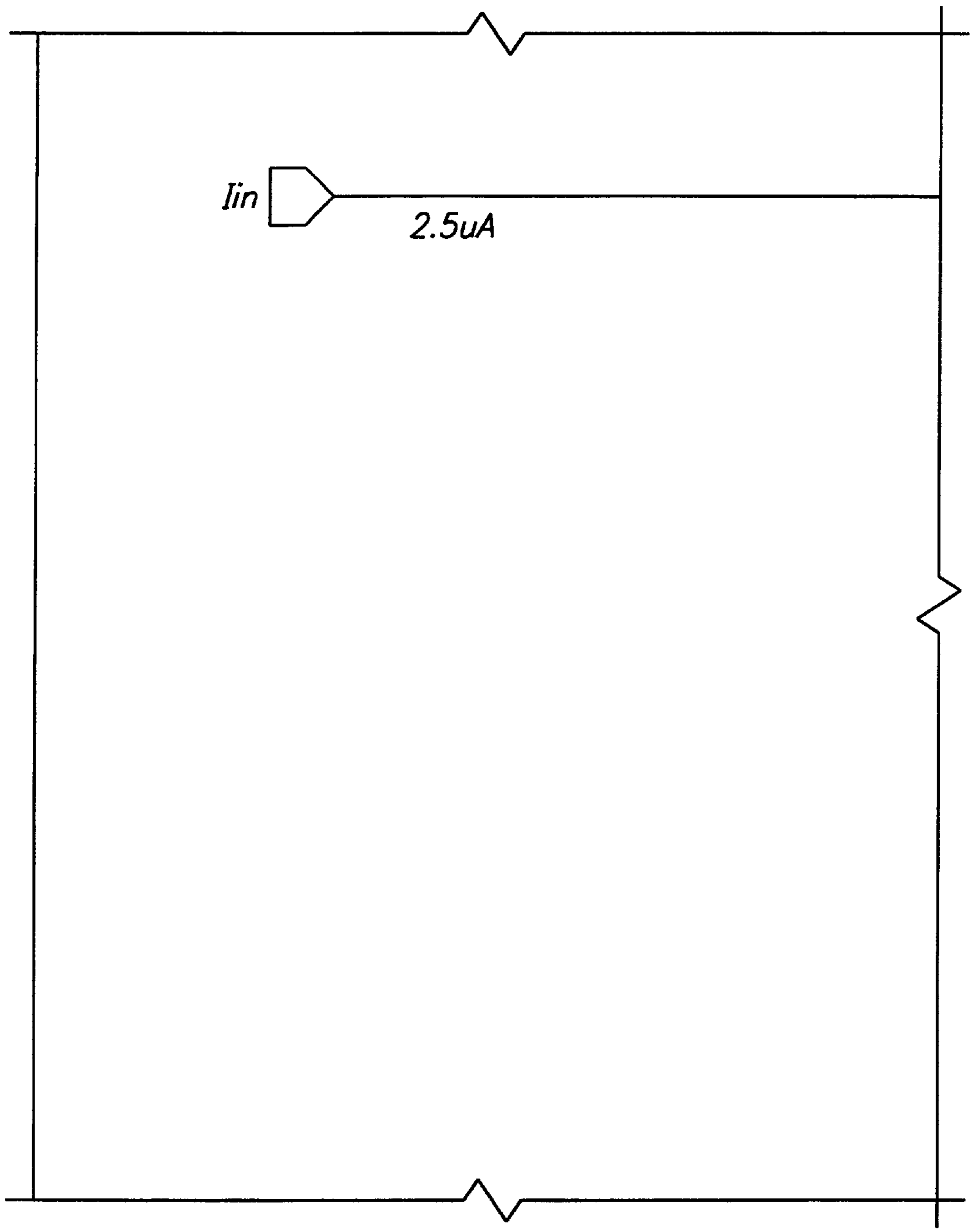
Fig 8.050402BA

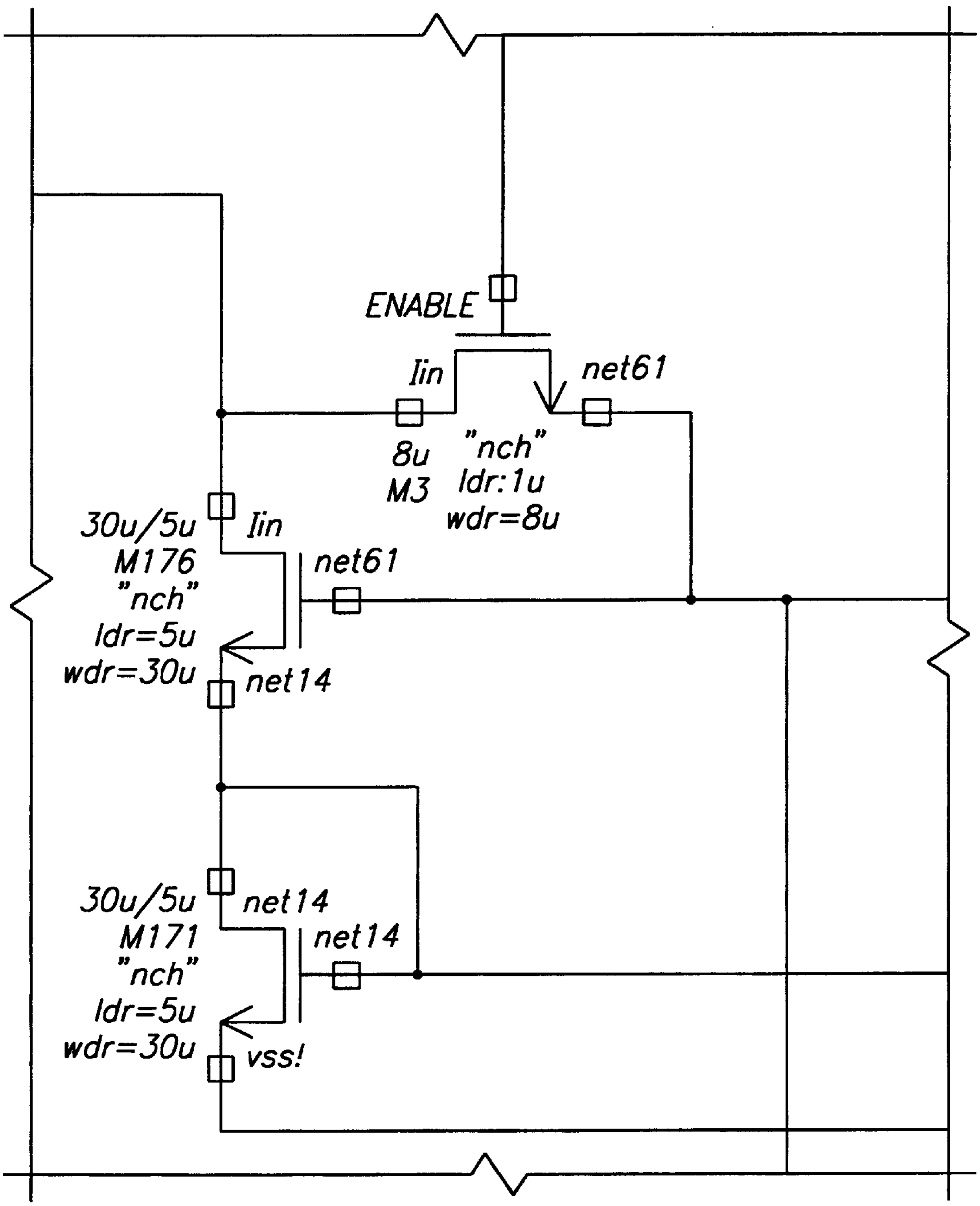
Fig. 8.050402BB

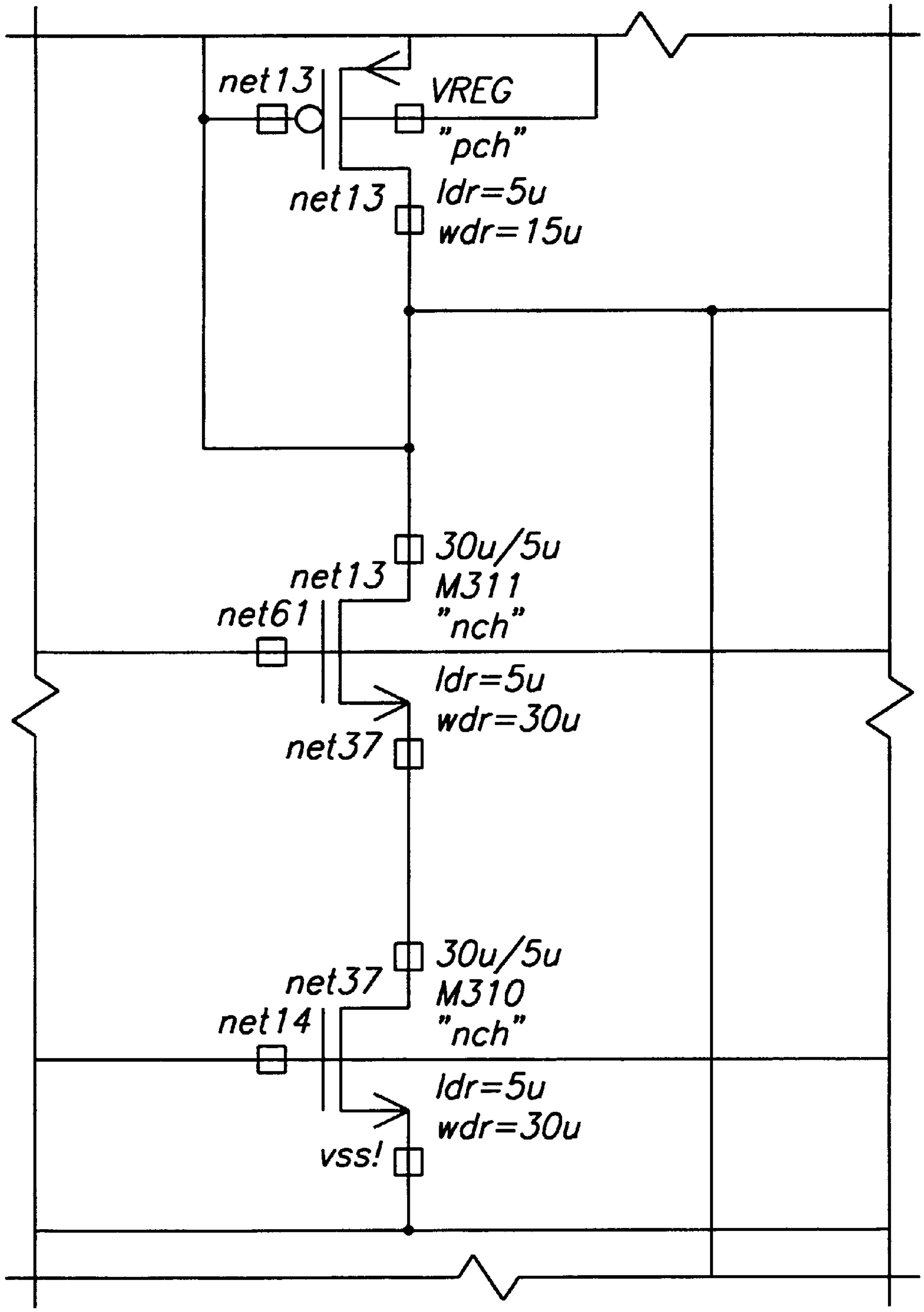
Fig 8.050402BC

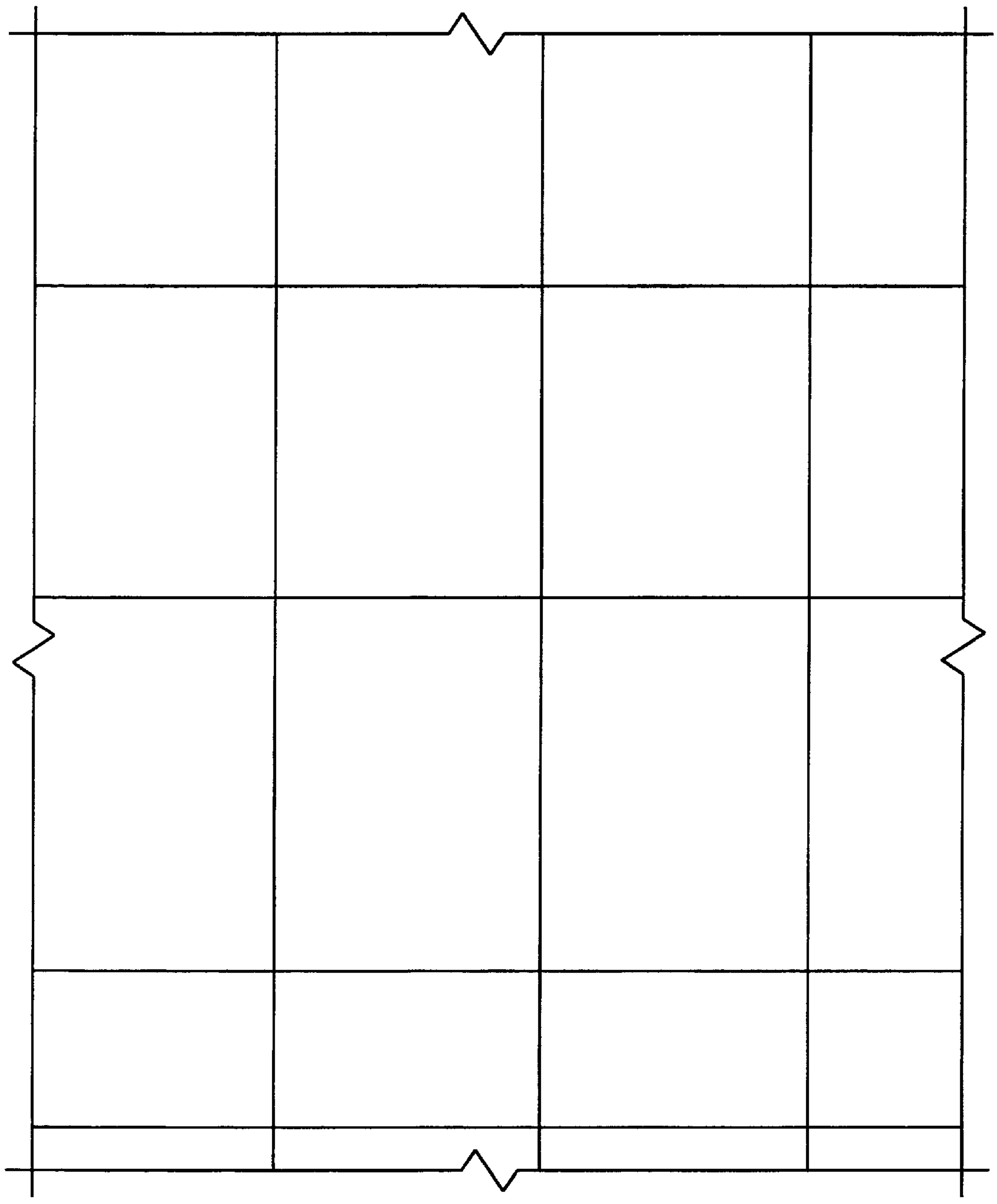
Fig 8.050402BD

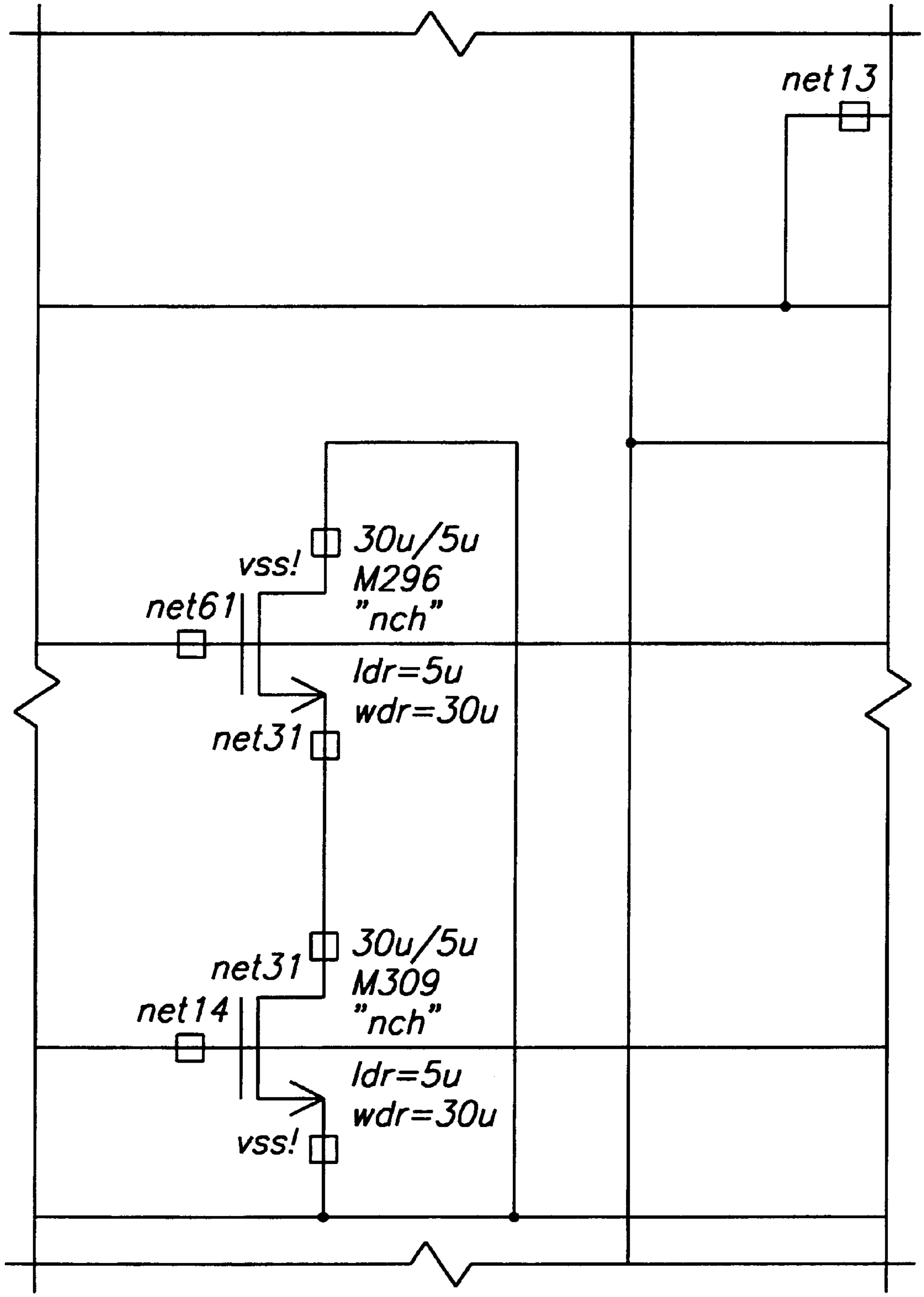
FIG. 8.050402BE

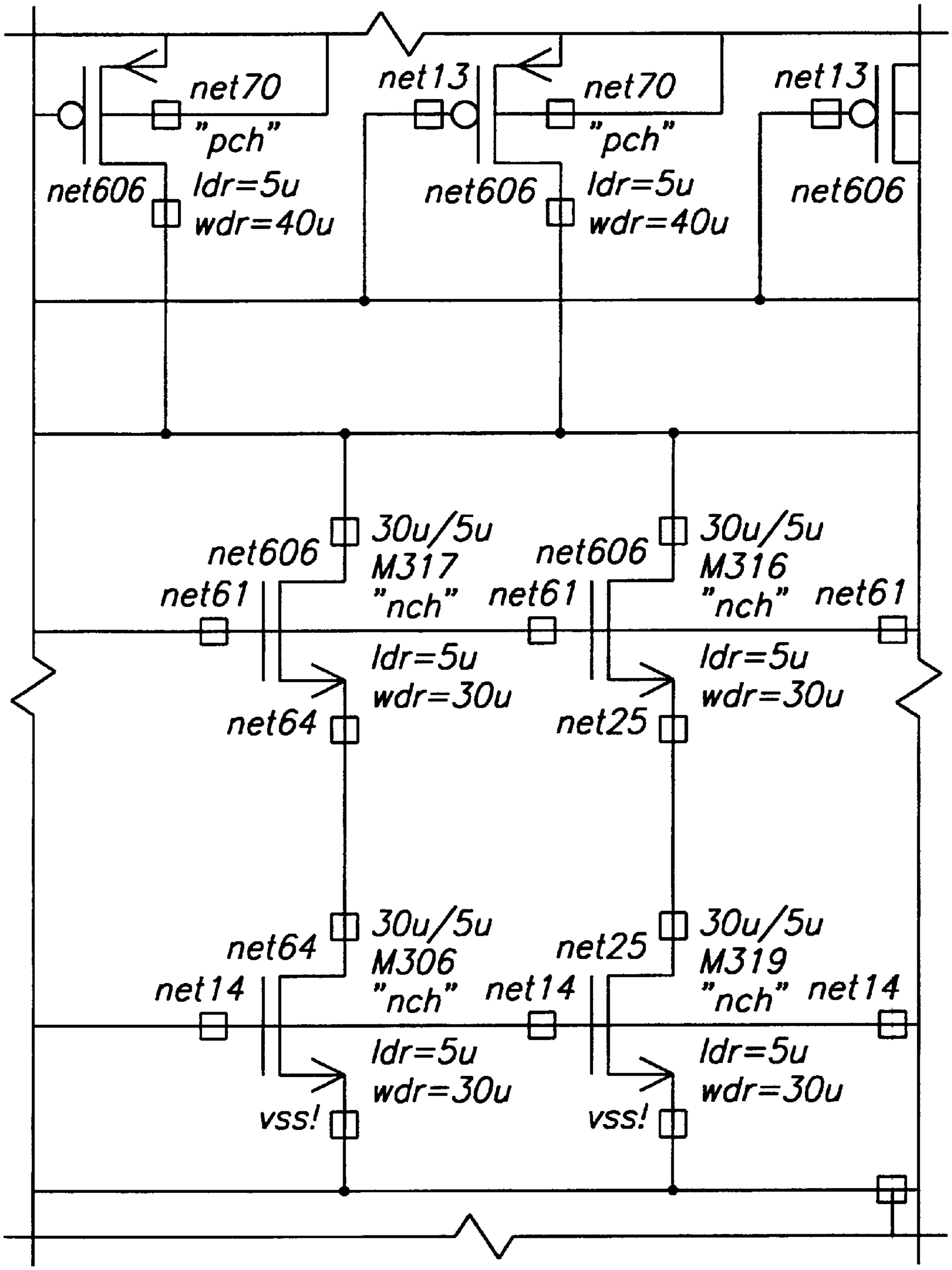
Fig 8.050402BF

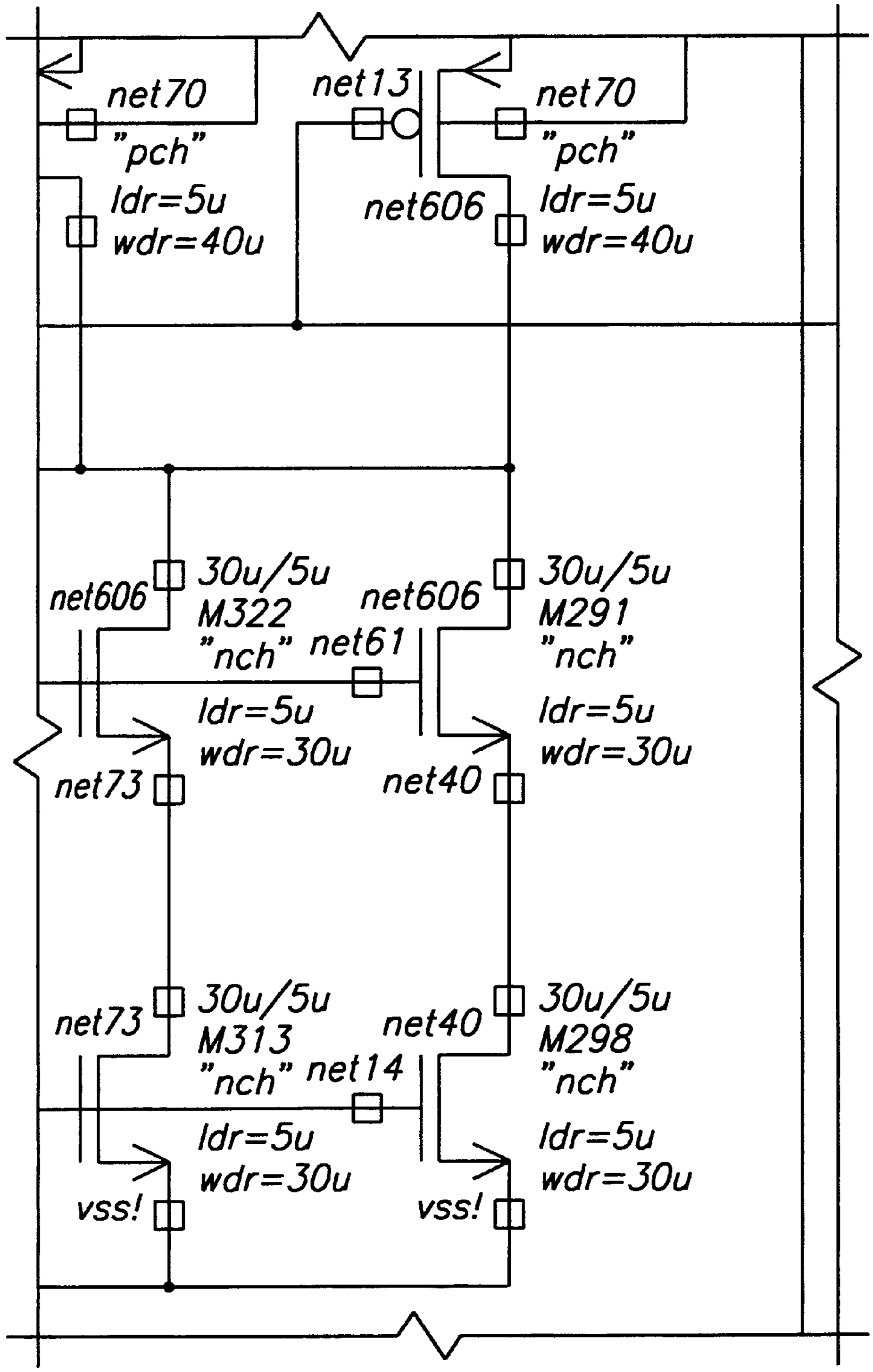
Fig 8.050402BG

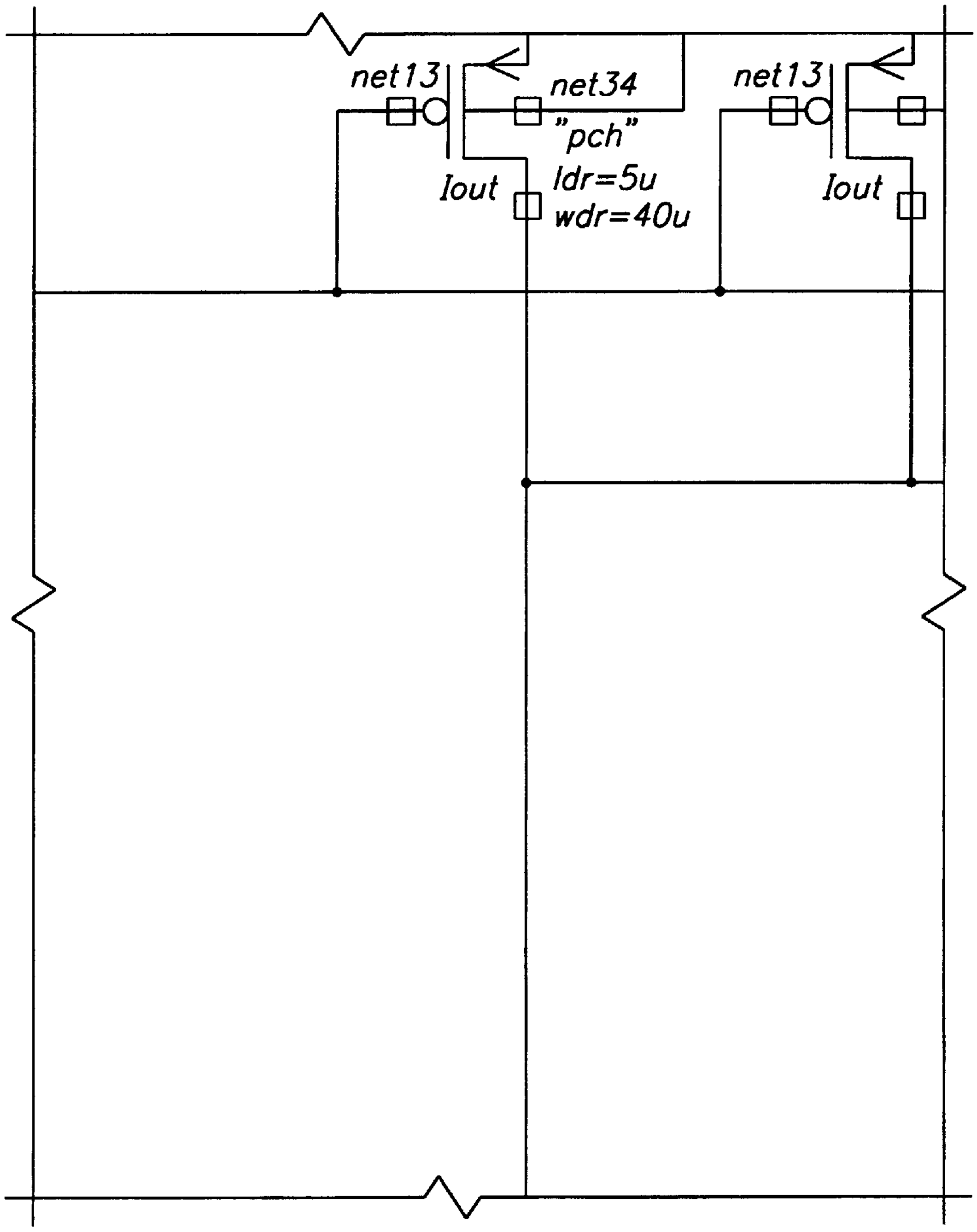
FIG 8.050402BH

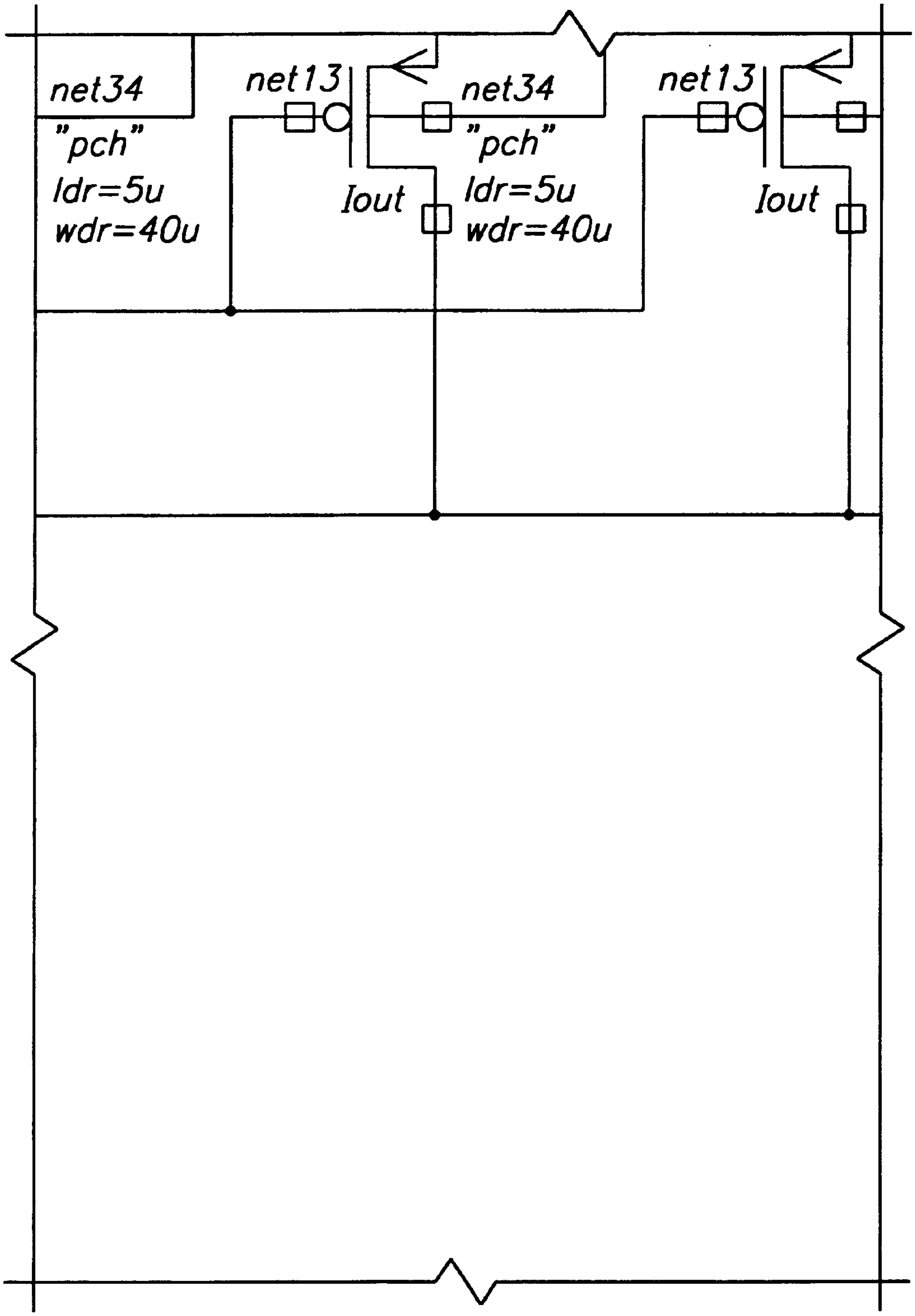
Fig 8.050402BI

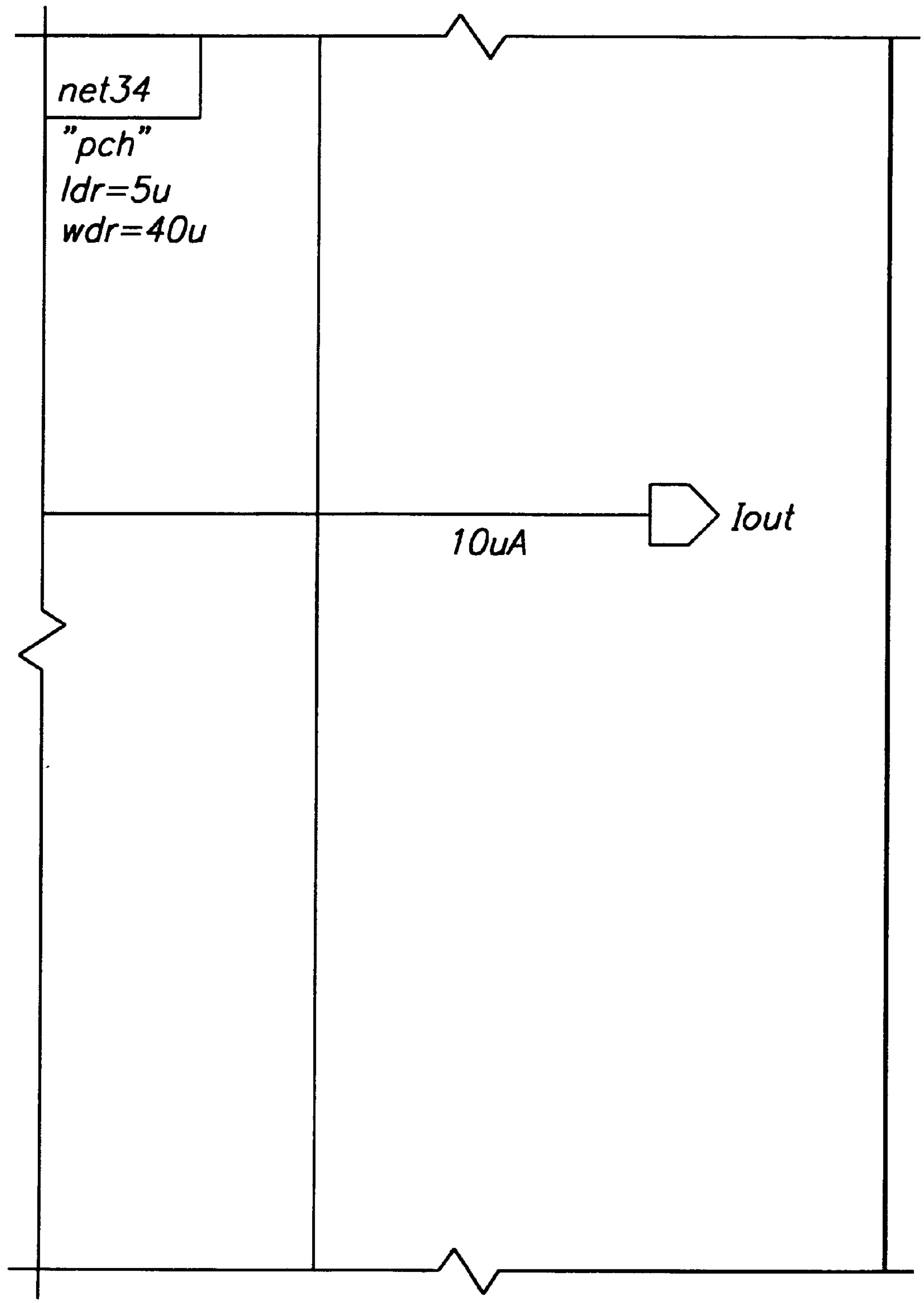
Fig. 8.050402B.1

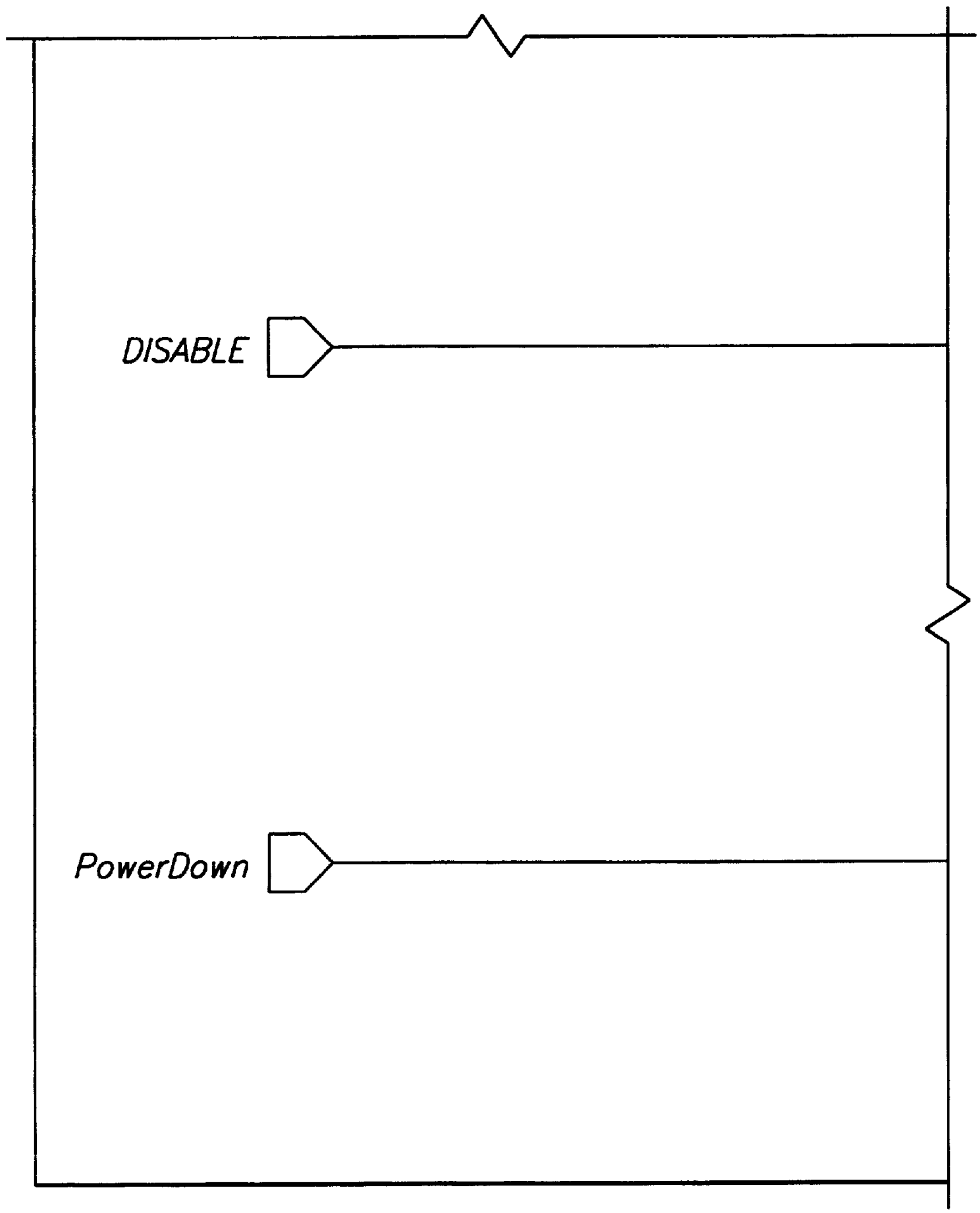
Fig 8.05040 2CA

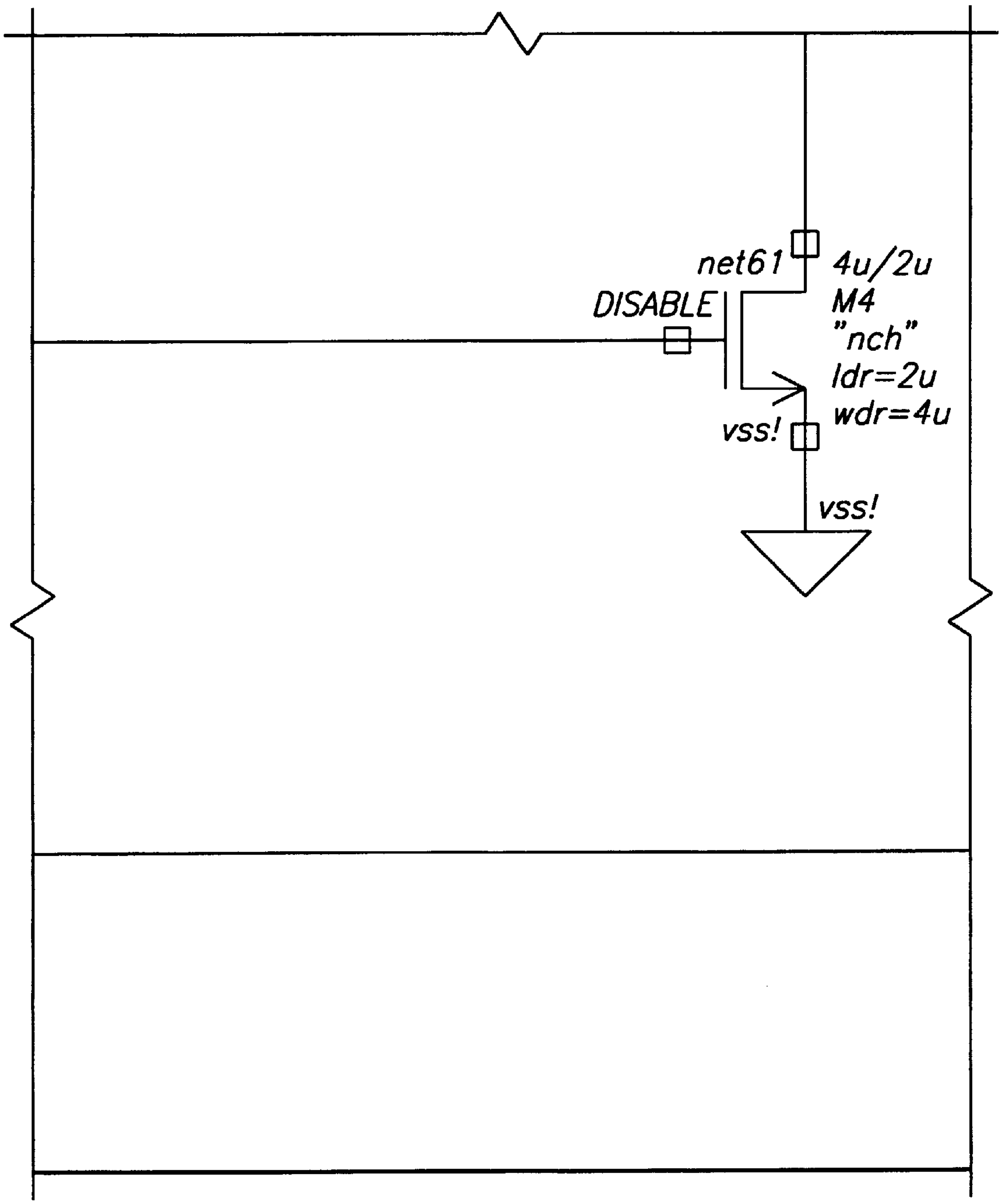
Fig 8.050402CB

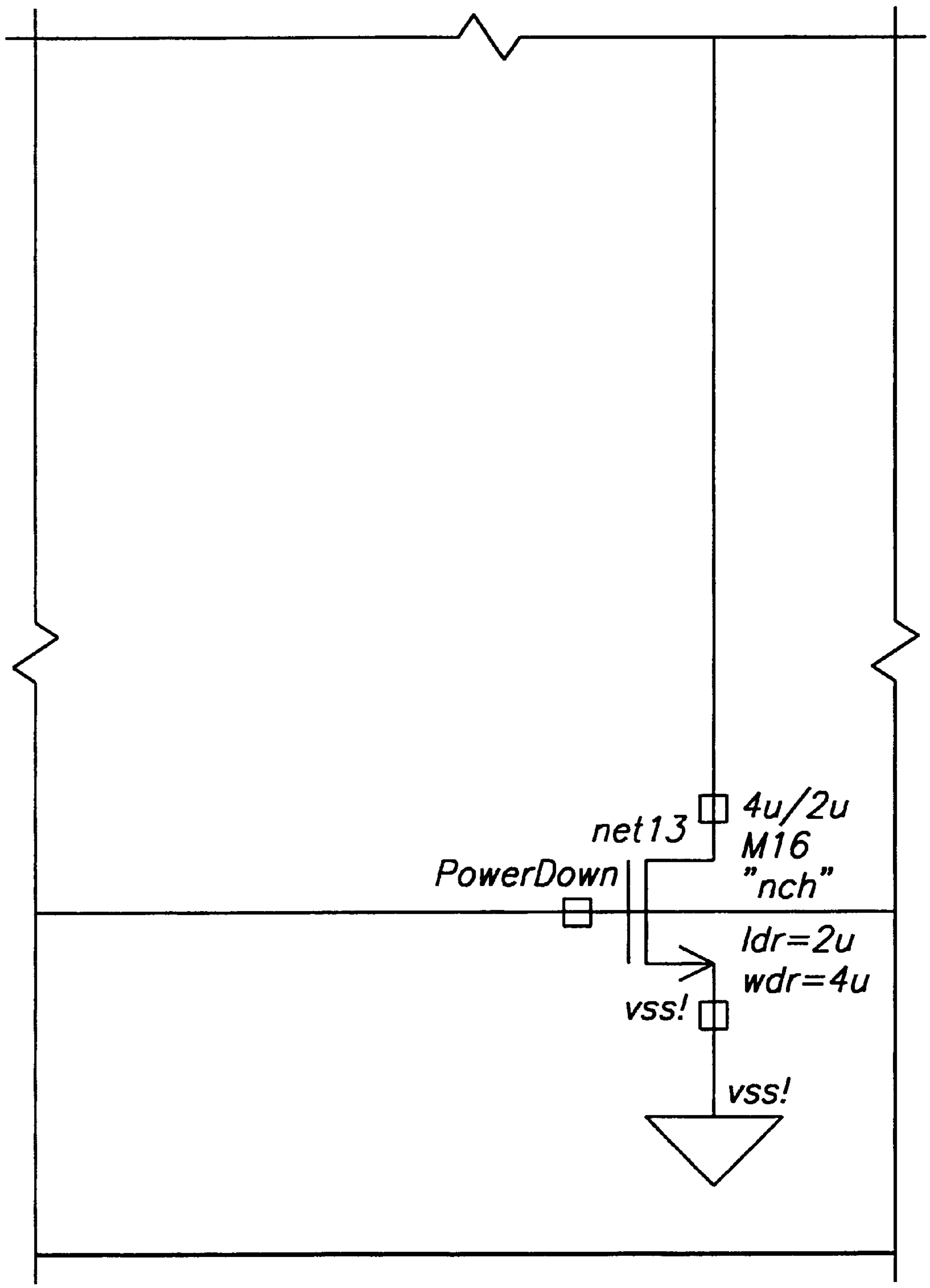
Fig 8.0504O2CC

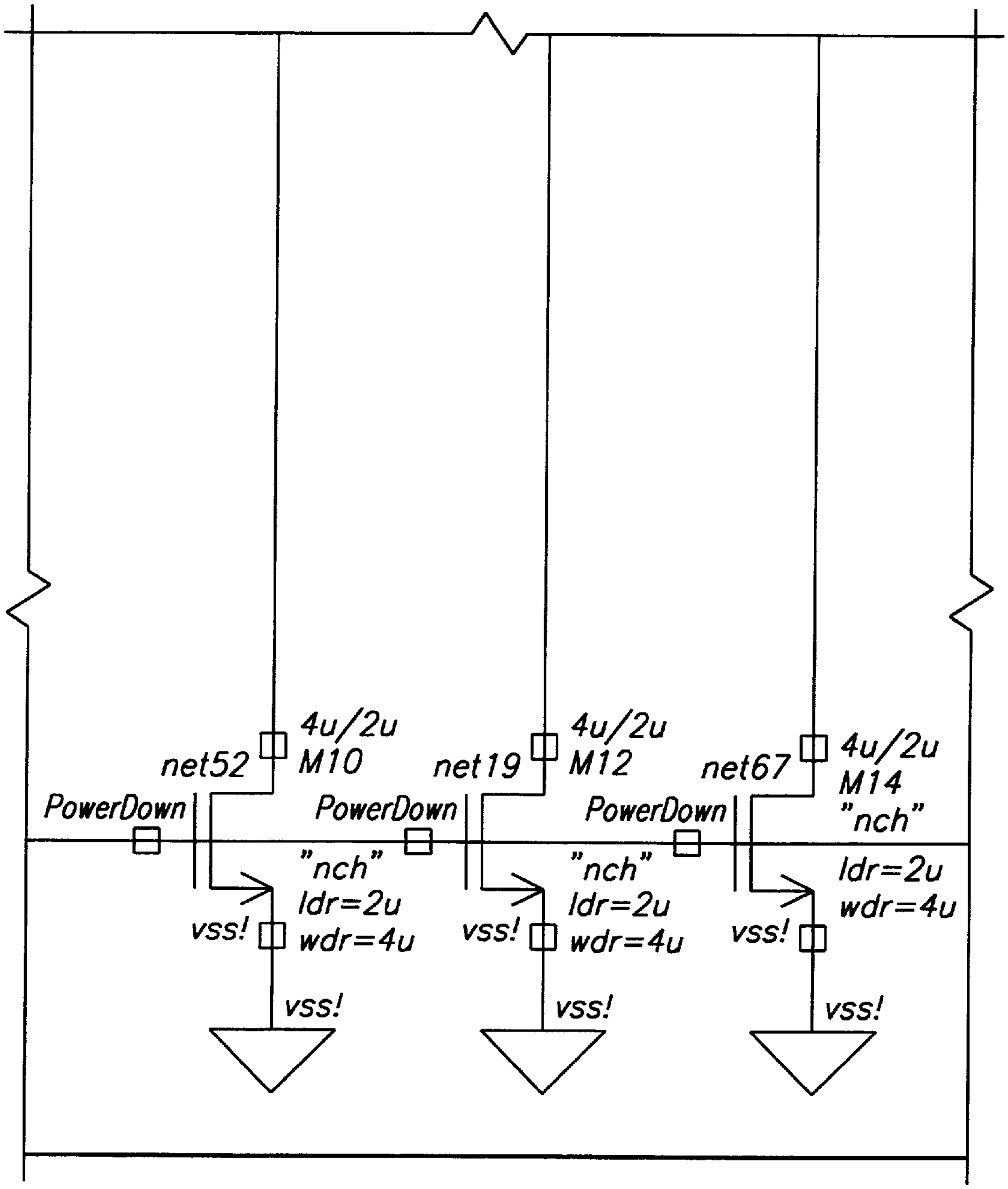
Fig 8.050402CD

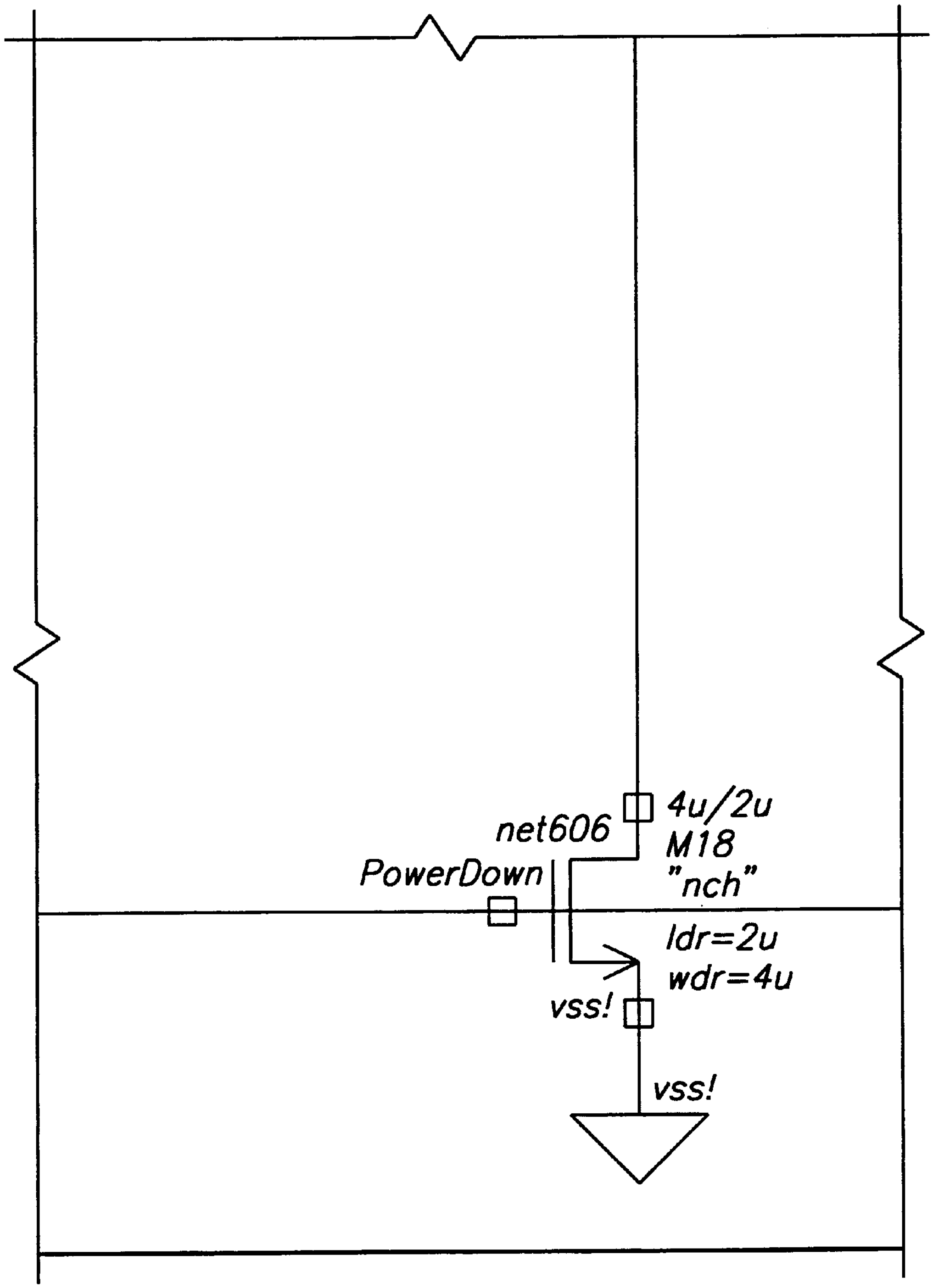
Fig 8.050402CE

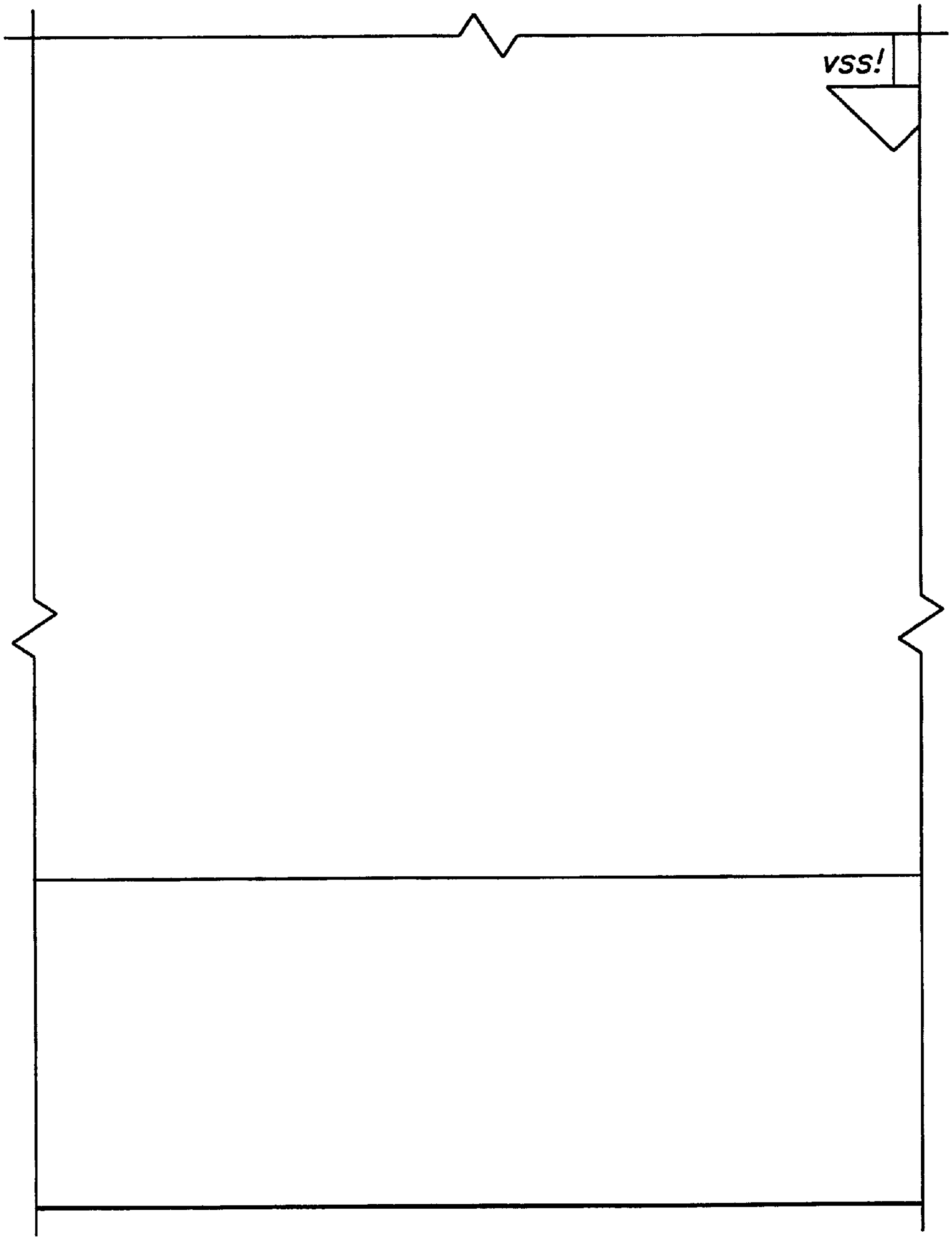
Fig 8.050402CF

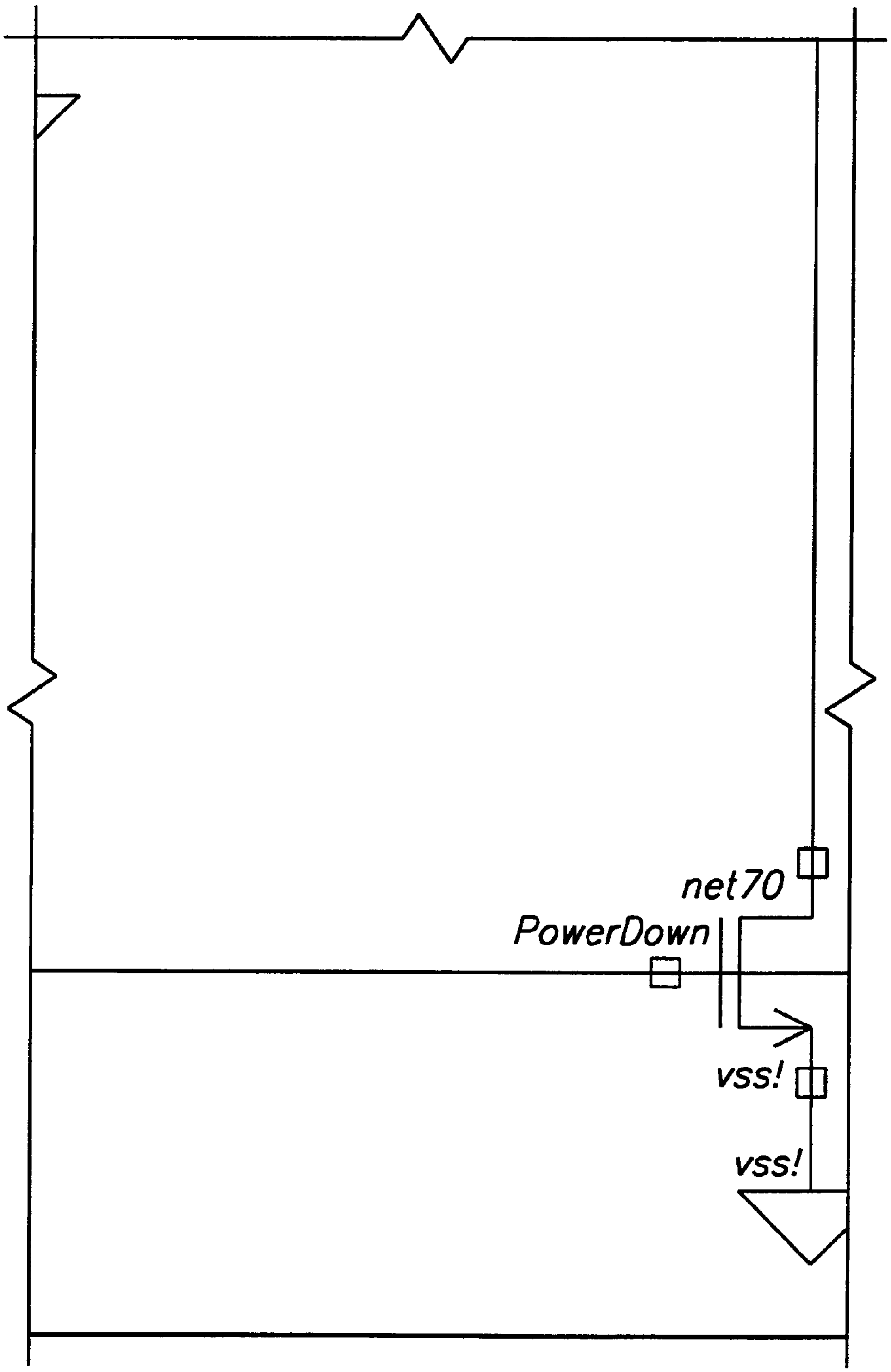
Fig 8.050402CG

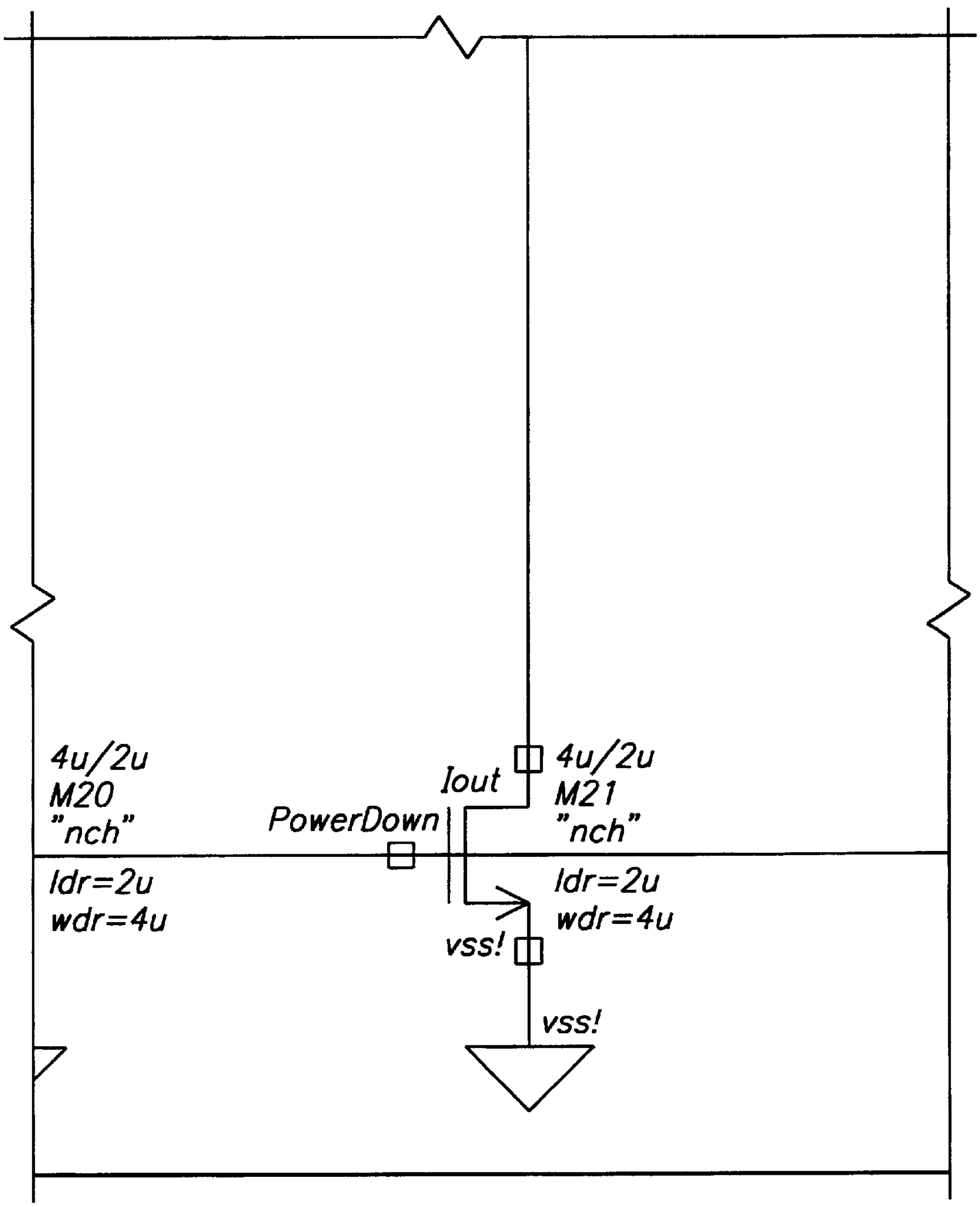
Fig 8.050402CH

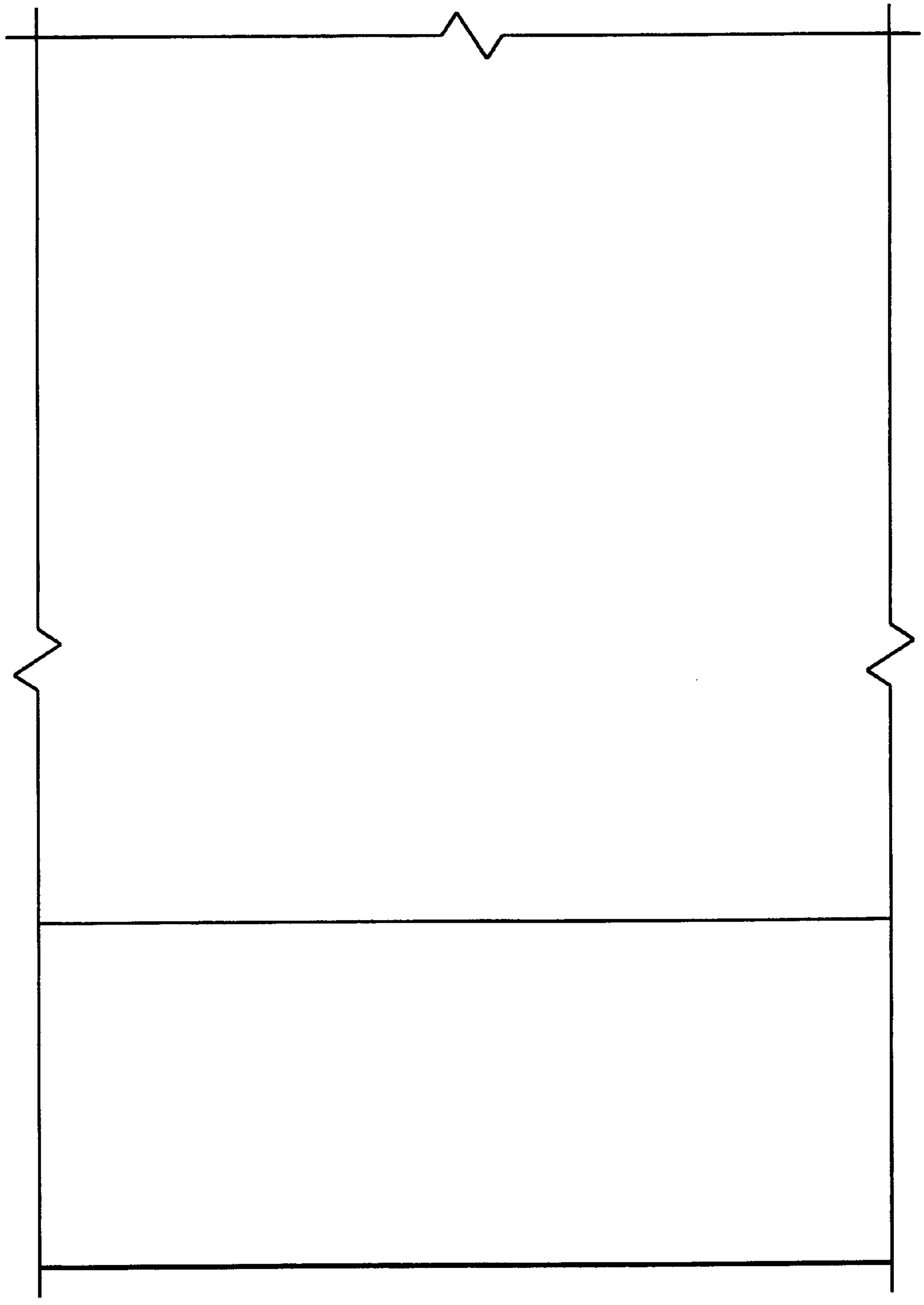
Fig 8.050402CI

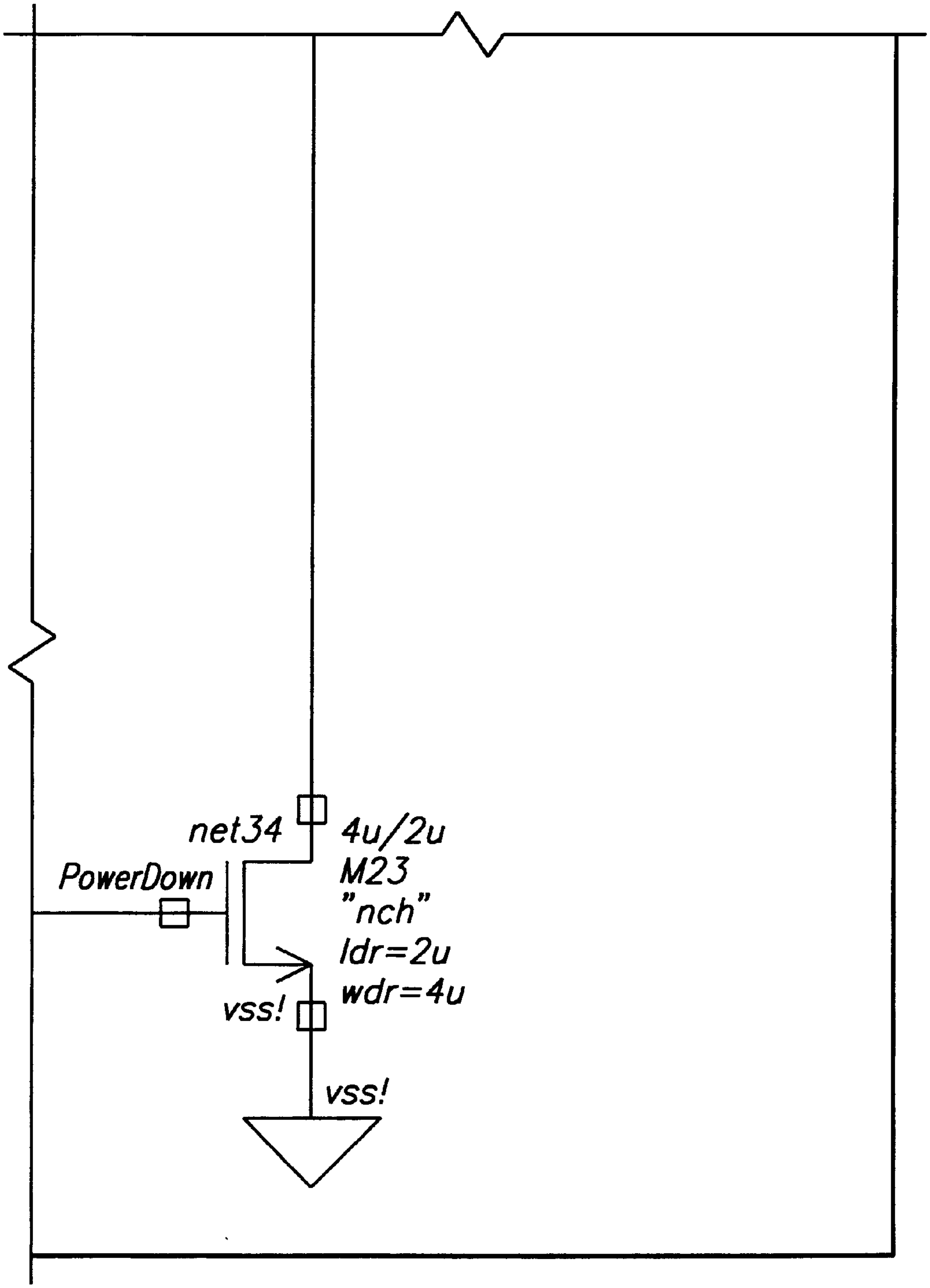
Fig. 8.050402CJ

| | | | | | | | | |
|---|---|---|---|---|---|---|---|---|
| 8.050403AA | 8.050403AB | 8.050403AC | 8.050403AD | 8.050403AE | 8.050403AF | 8.050403AG | 8.050403AH | 8.050403AI |
| 8.050403BA | 8.050403BB | 8.050403BC | 8.050403BD | 8.050403BE | 8.050403BF | 8.050403BG | 8.050403BH | 8.050403BI |

FIG 8.050403

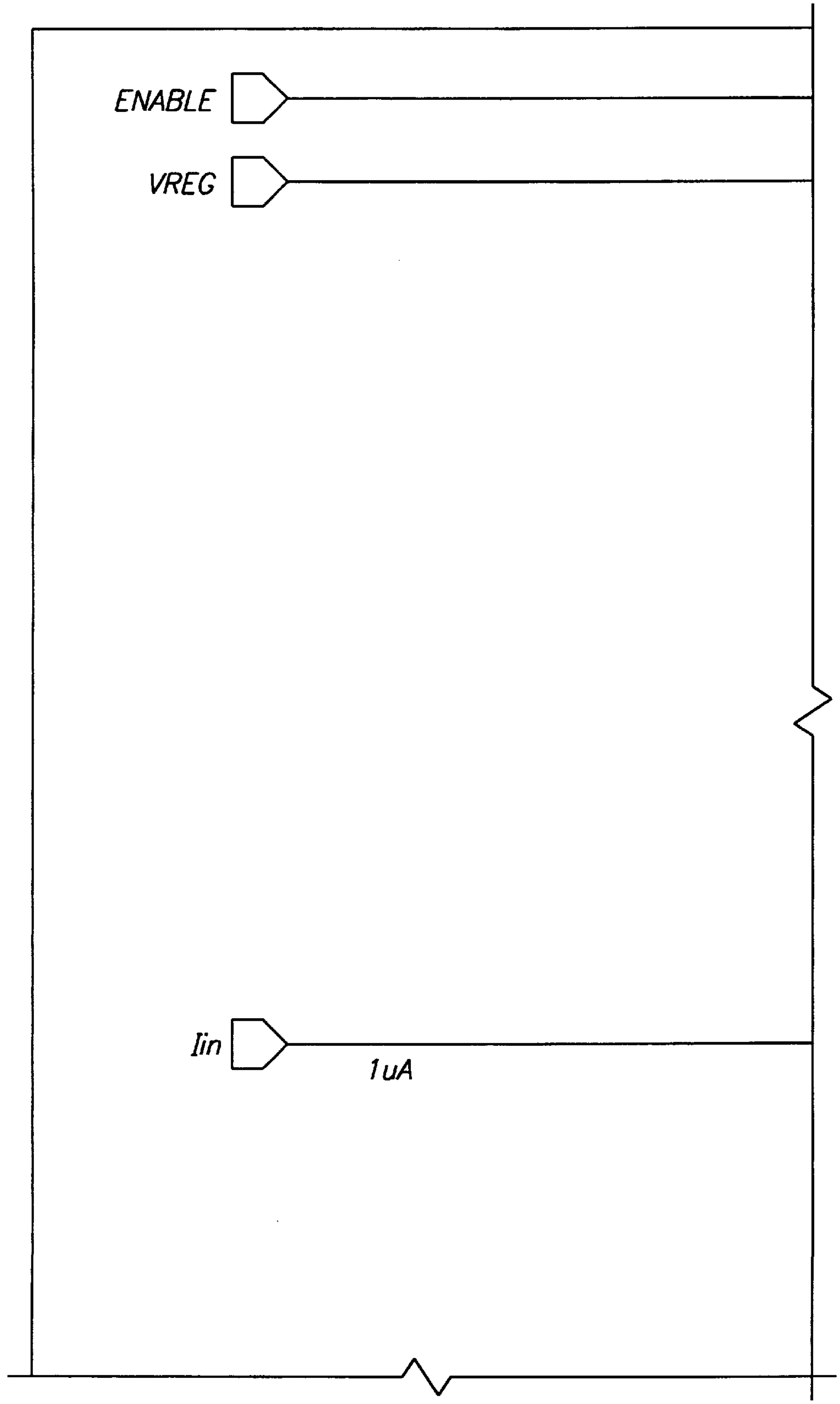
Fig 8.050403AA

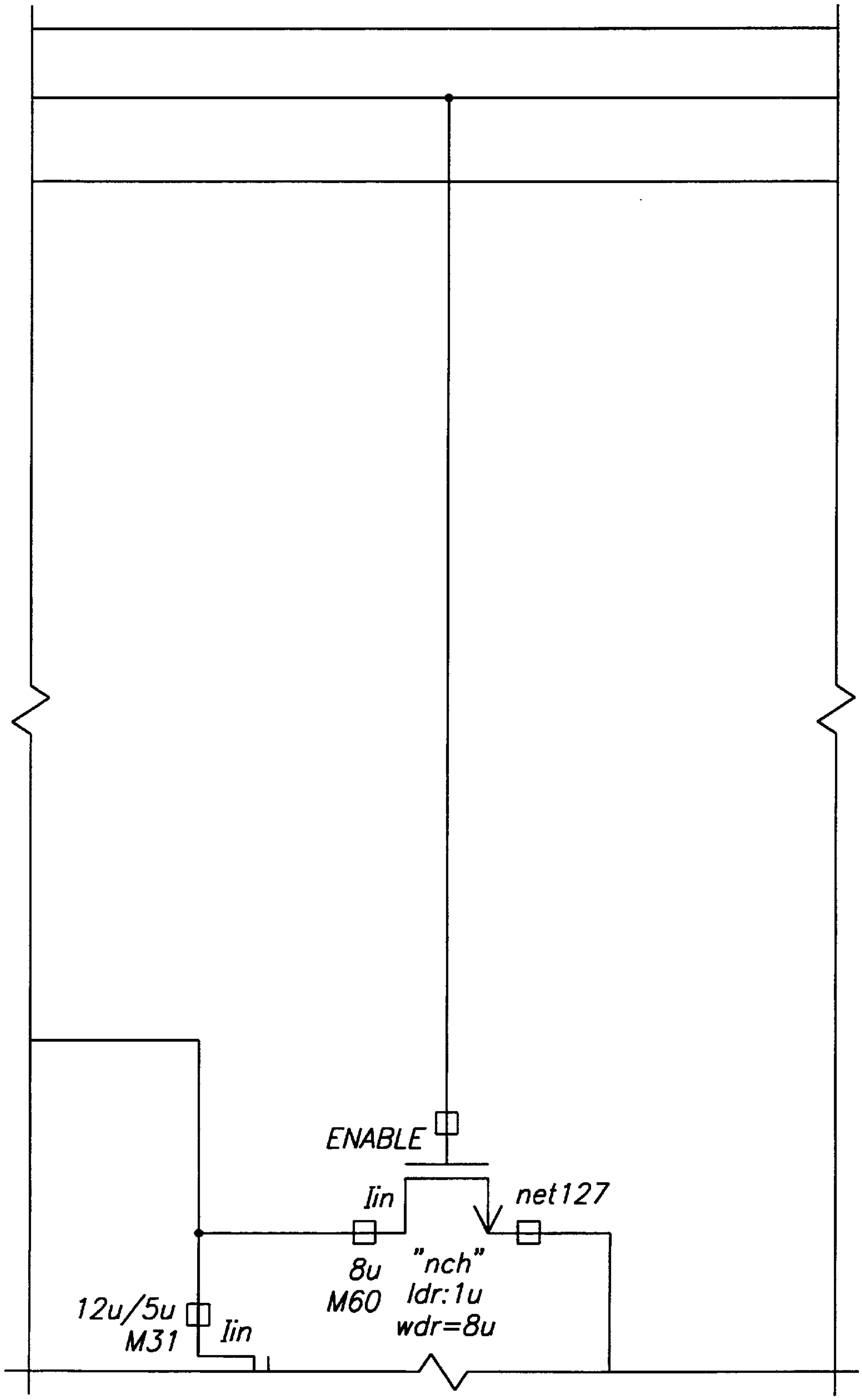
FIG 8.050403AB

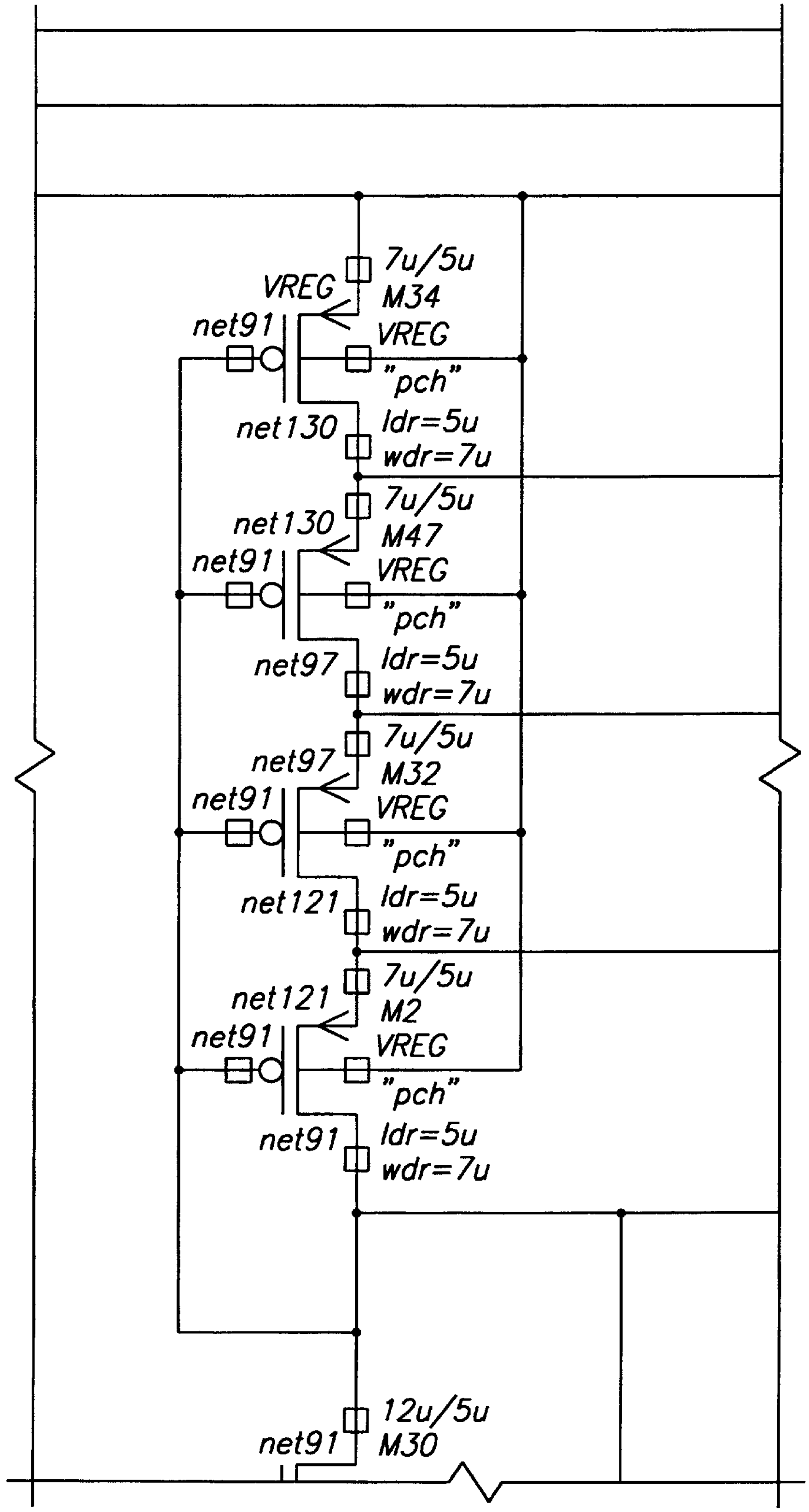
FIG 8.050403AC

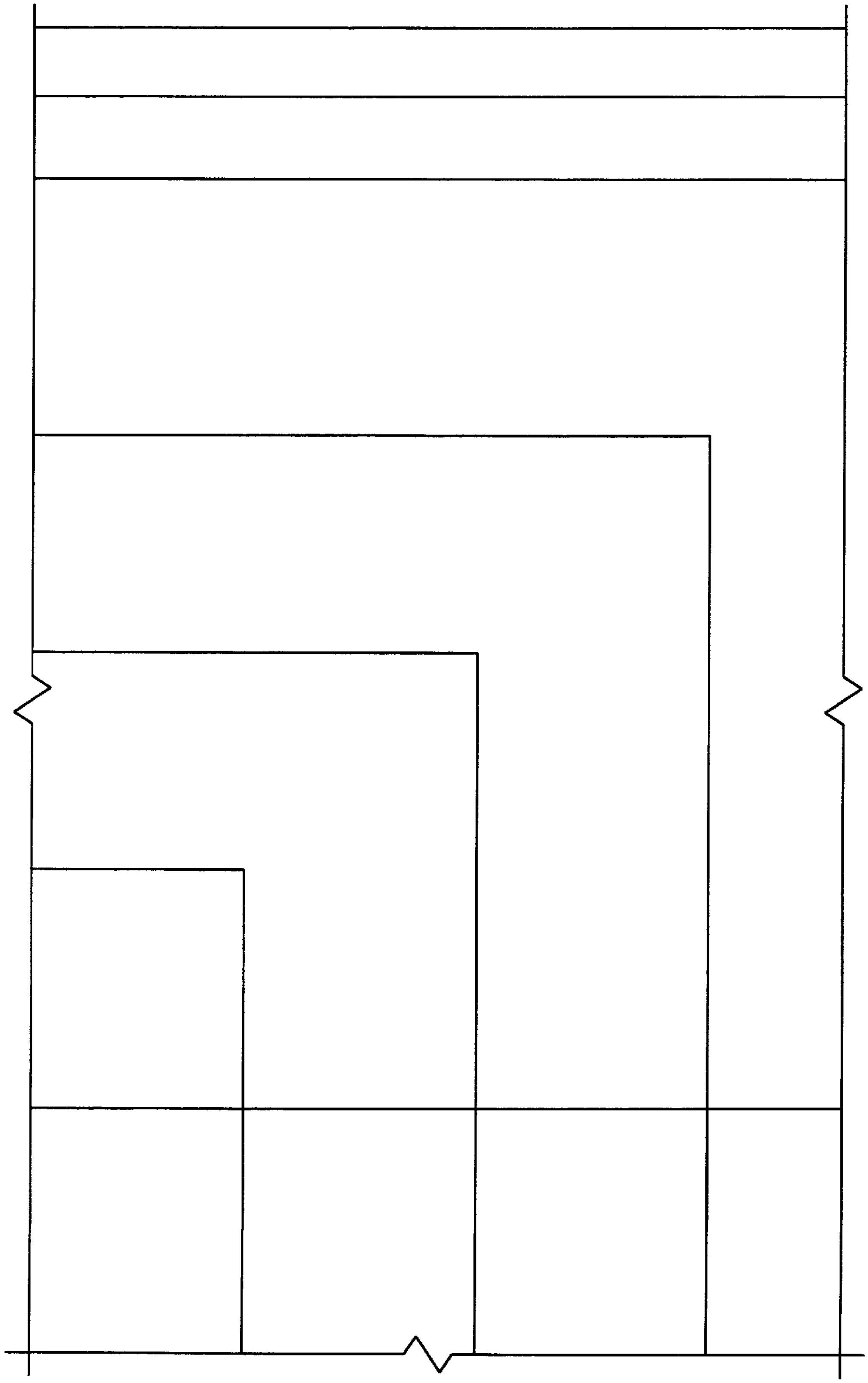
FIG. 8.05040.3AD

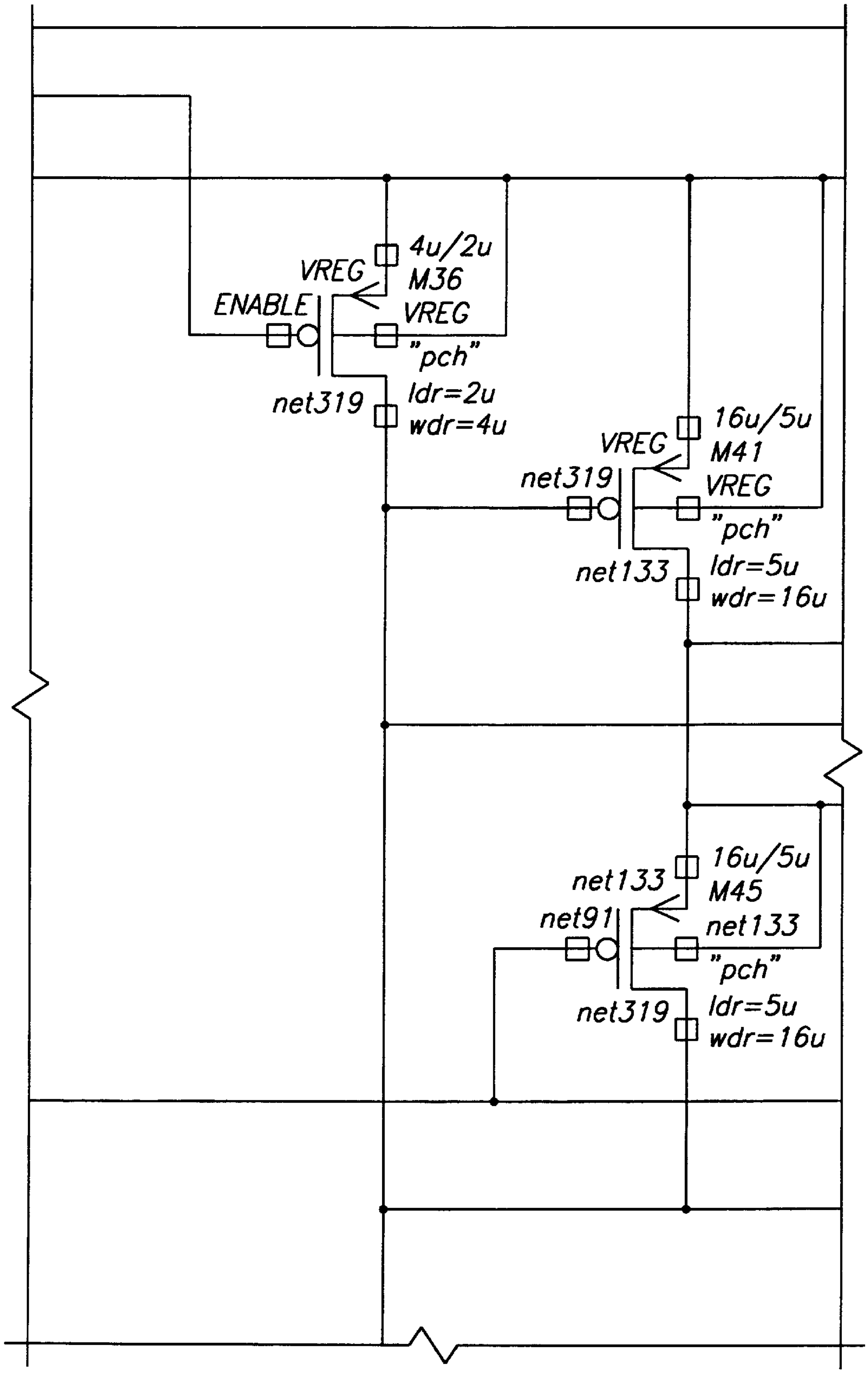
Fig 8.050403AE

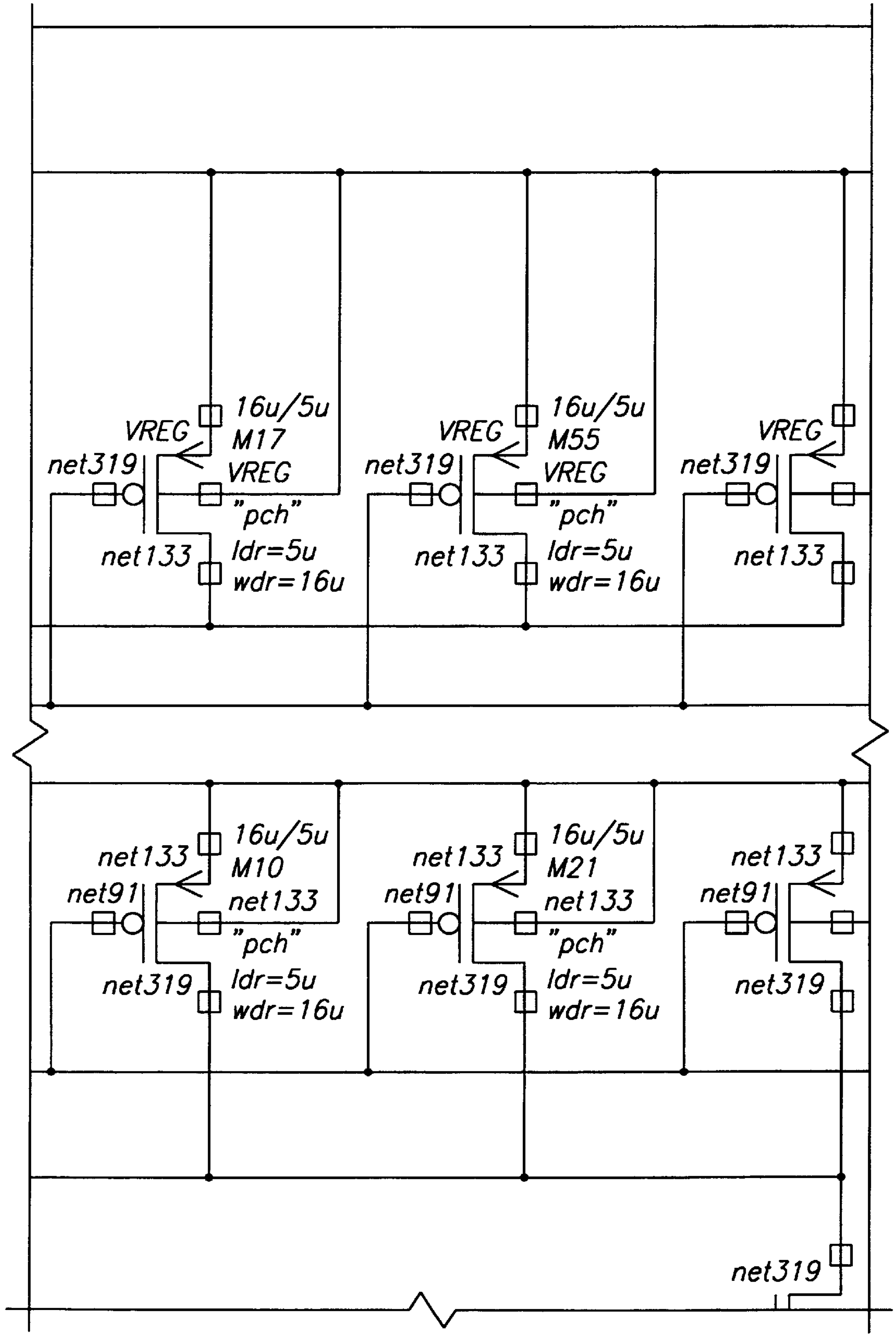
Fig. 8.0504.03AF

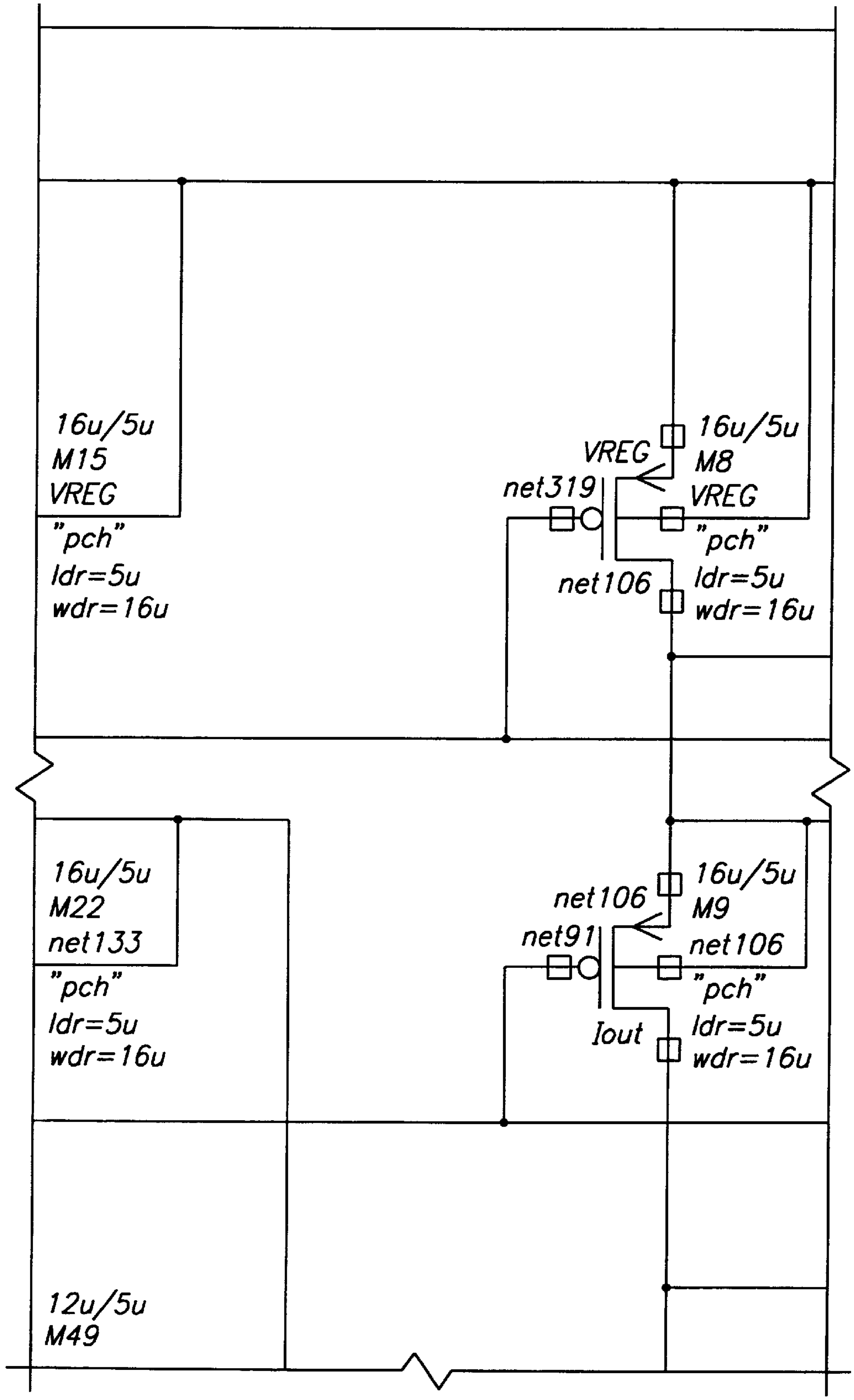
Fig 8.05040 3AG

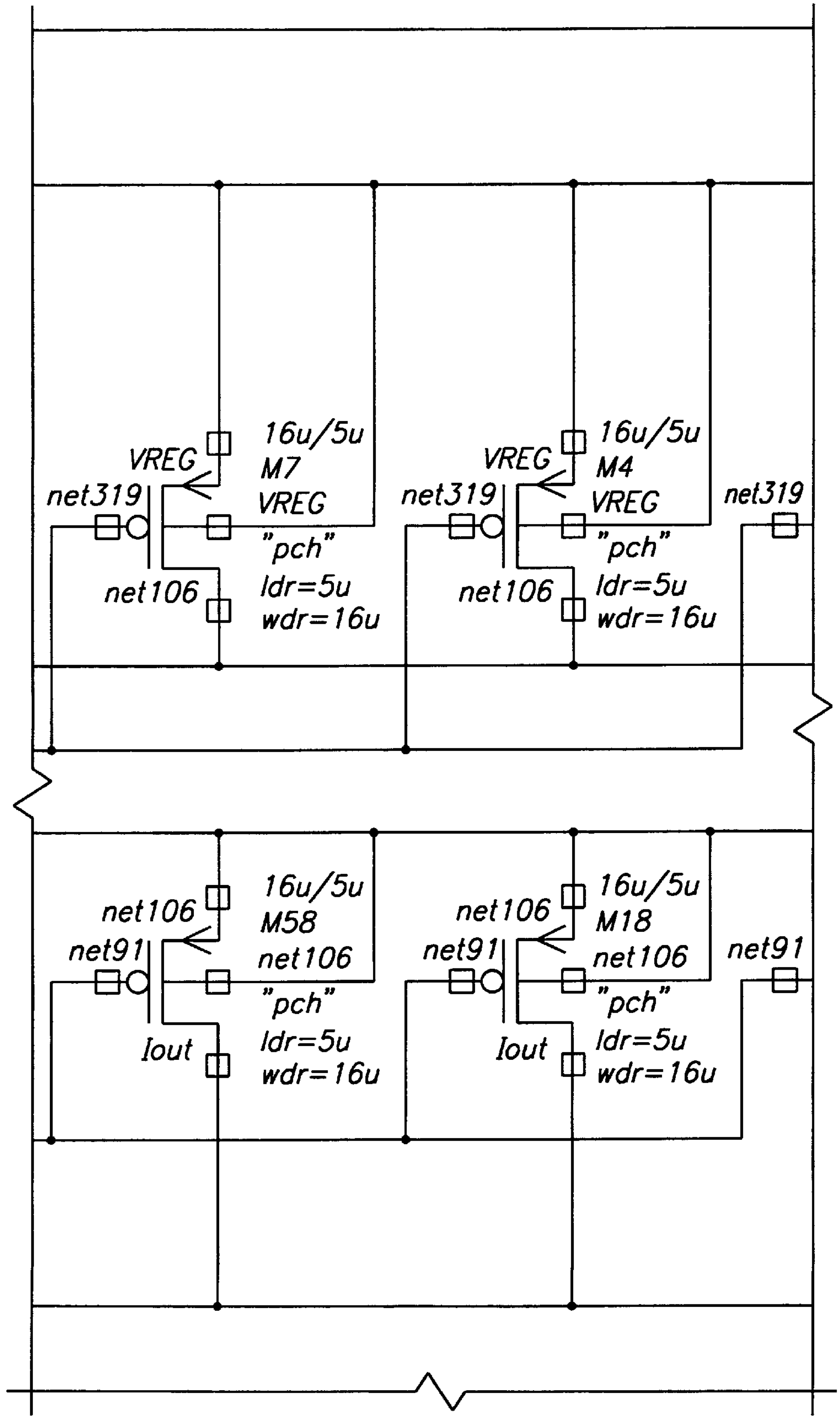
FIG 8.05.04.03AH

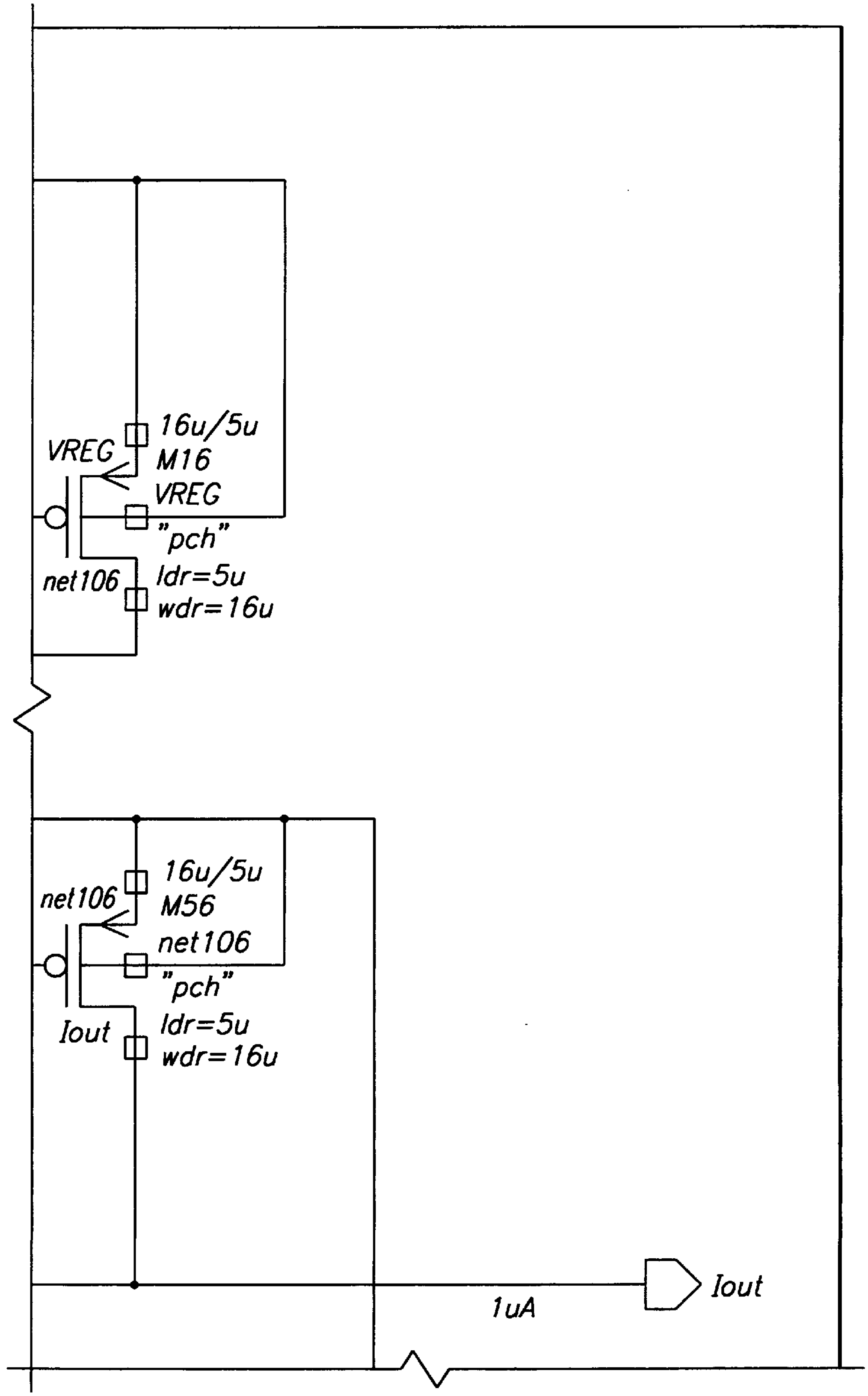
FIG 8.050403AI

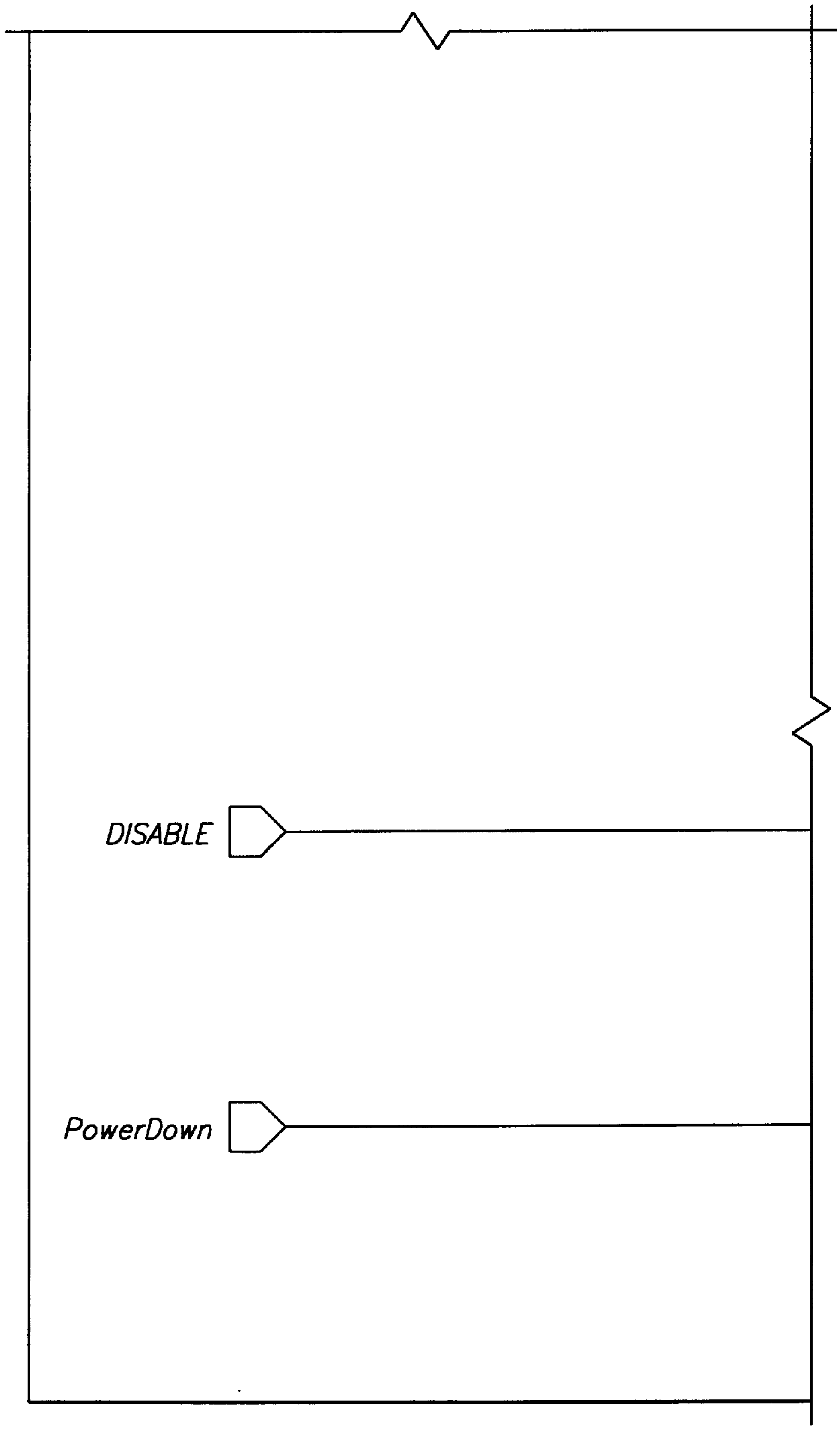
Fig 8.0504038A

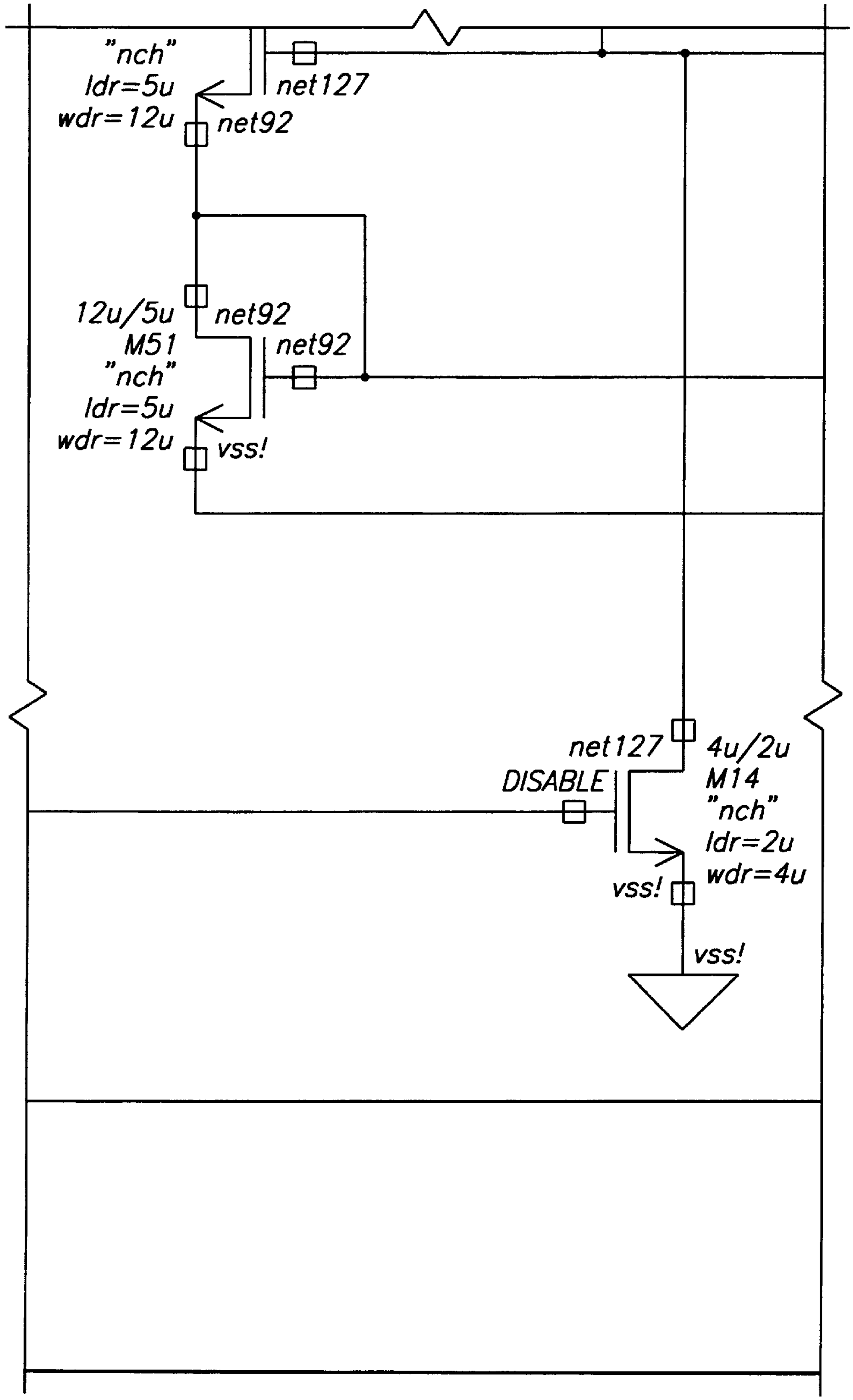
Fig 8.0504038B

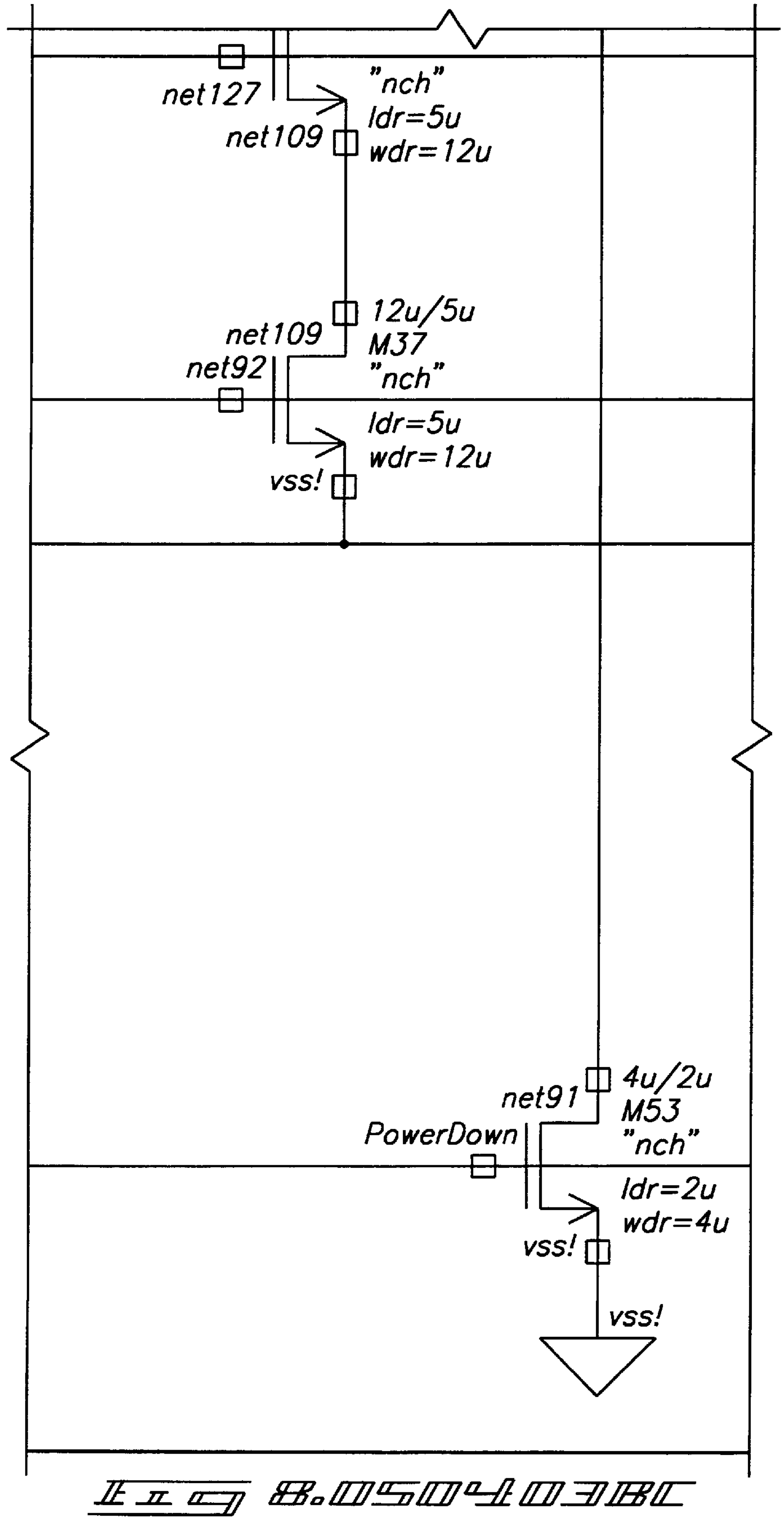
Fig 8.050403BC

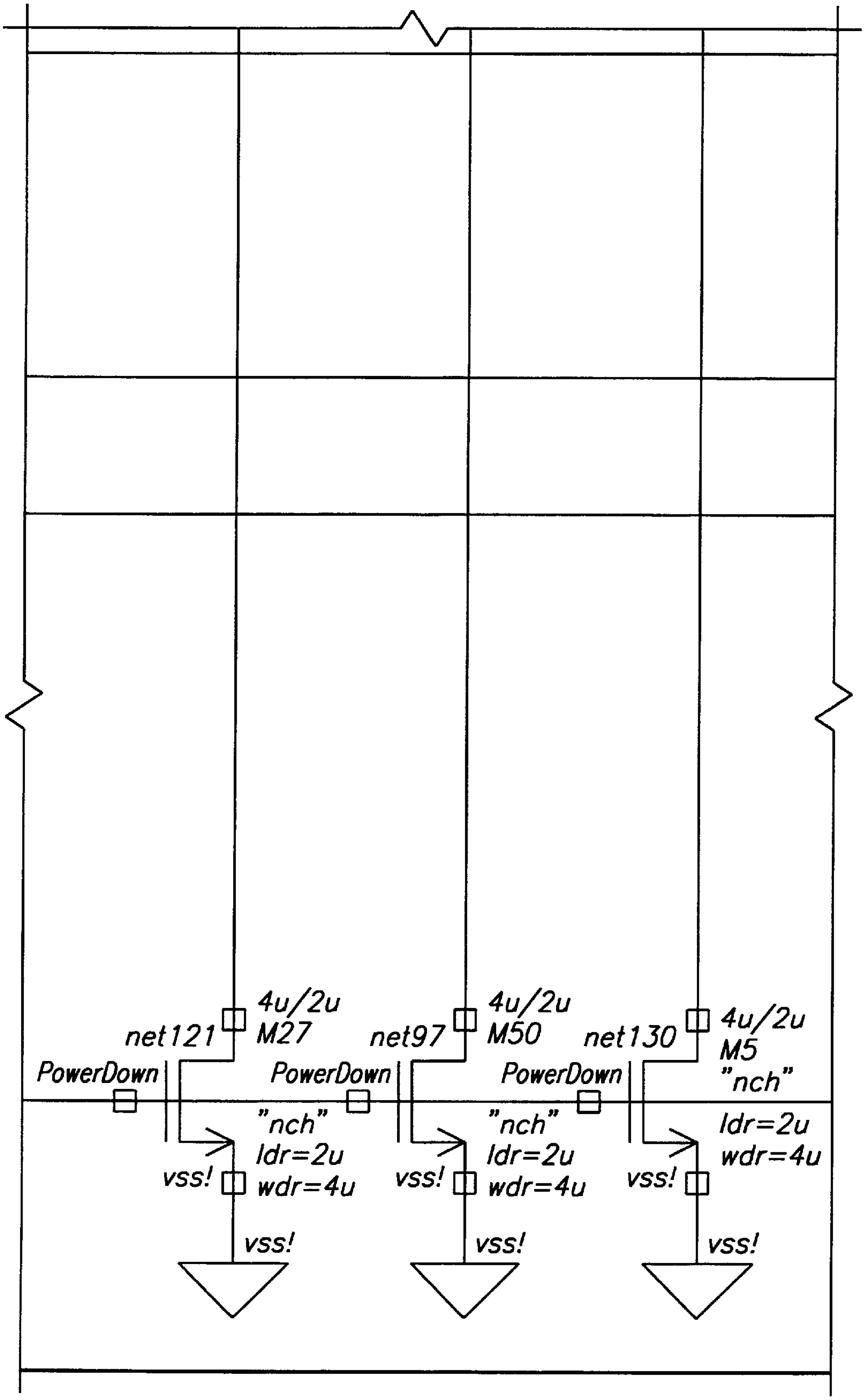
Fig 8.0504031BD

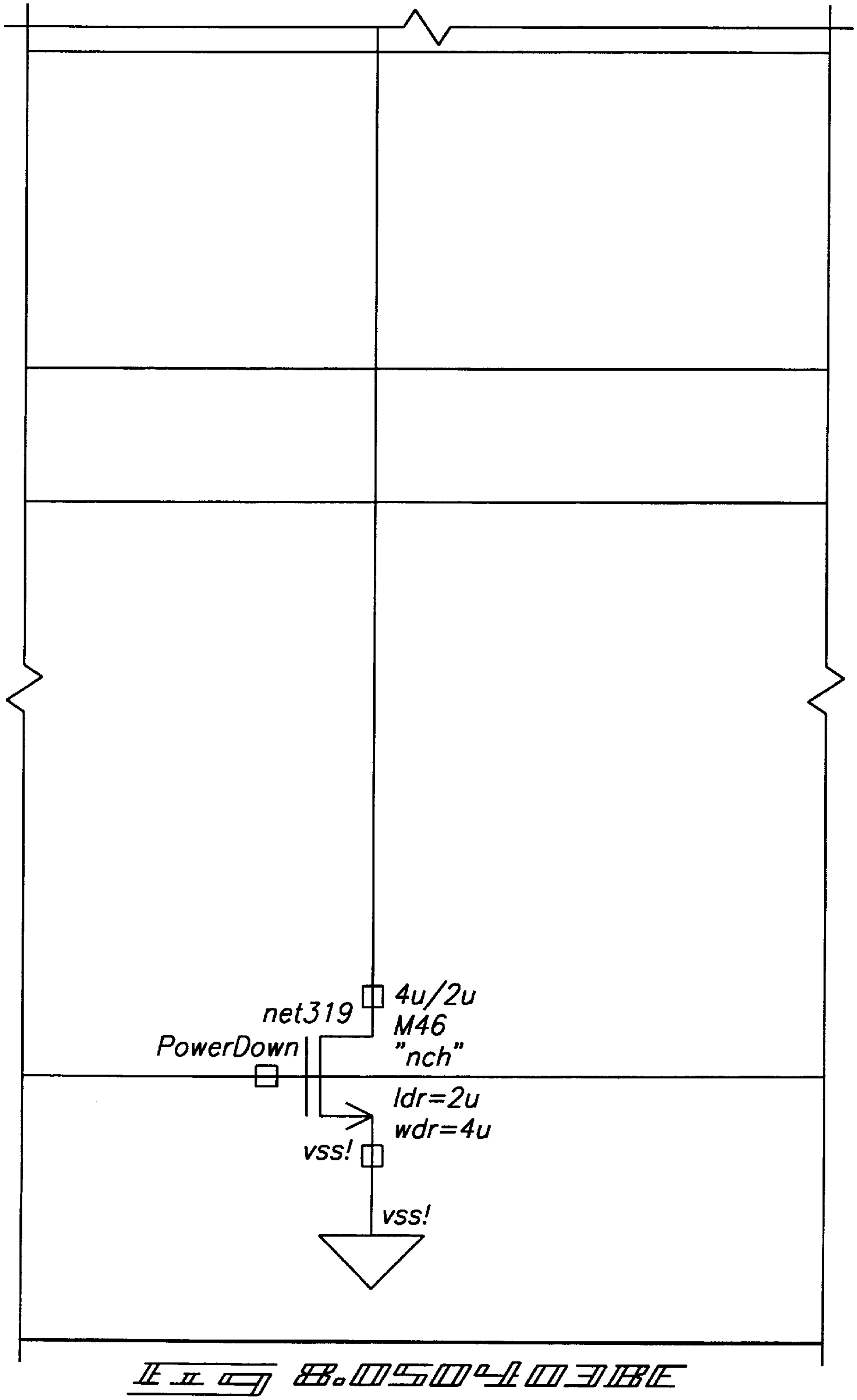
Fig 8.0504O3BE

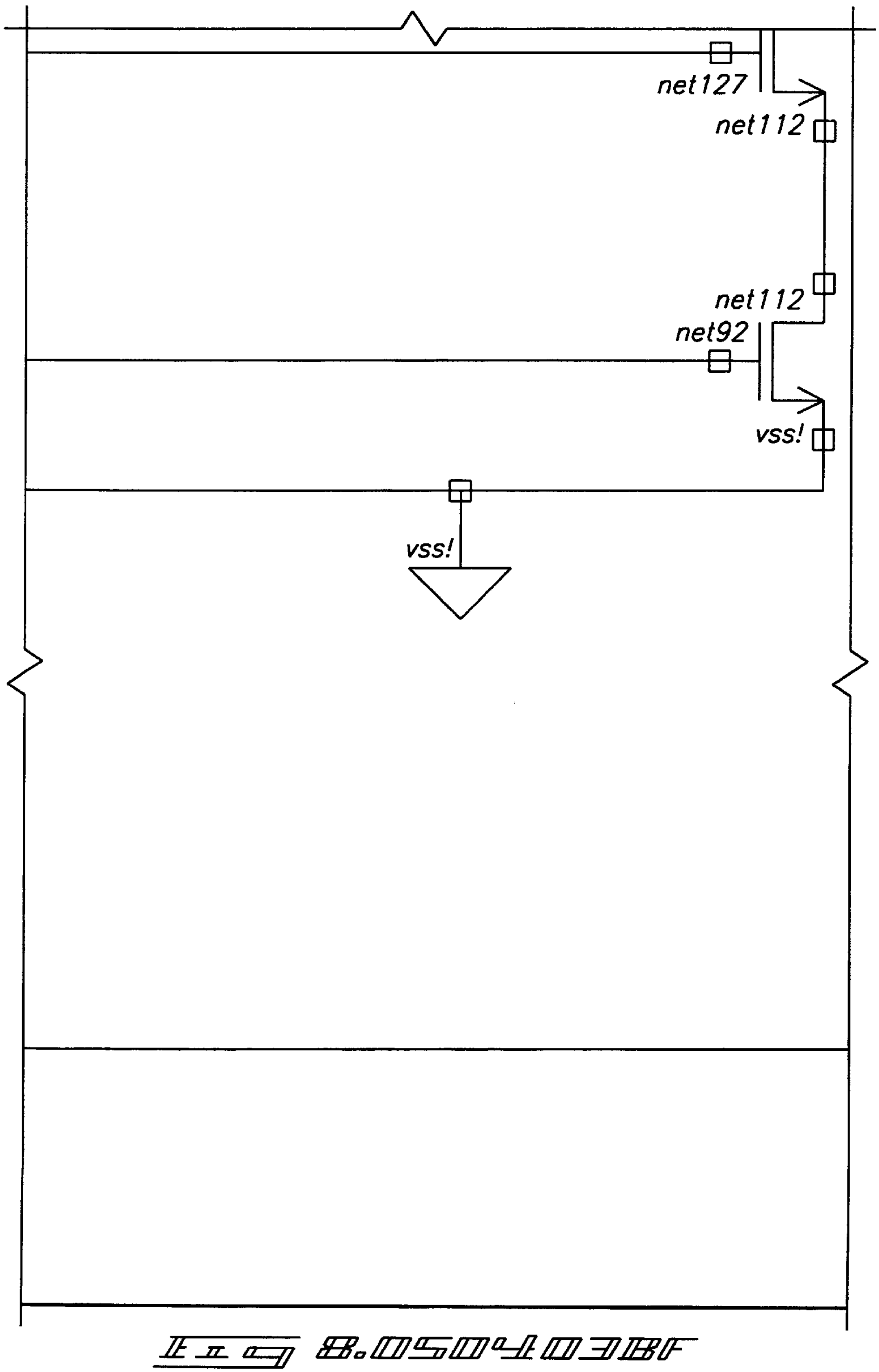
Fig 8.050403BF

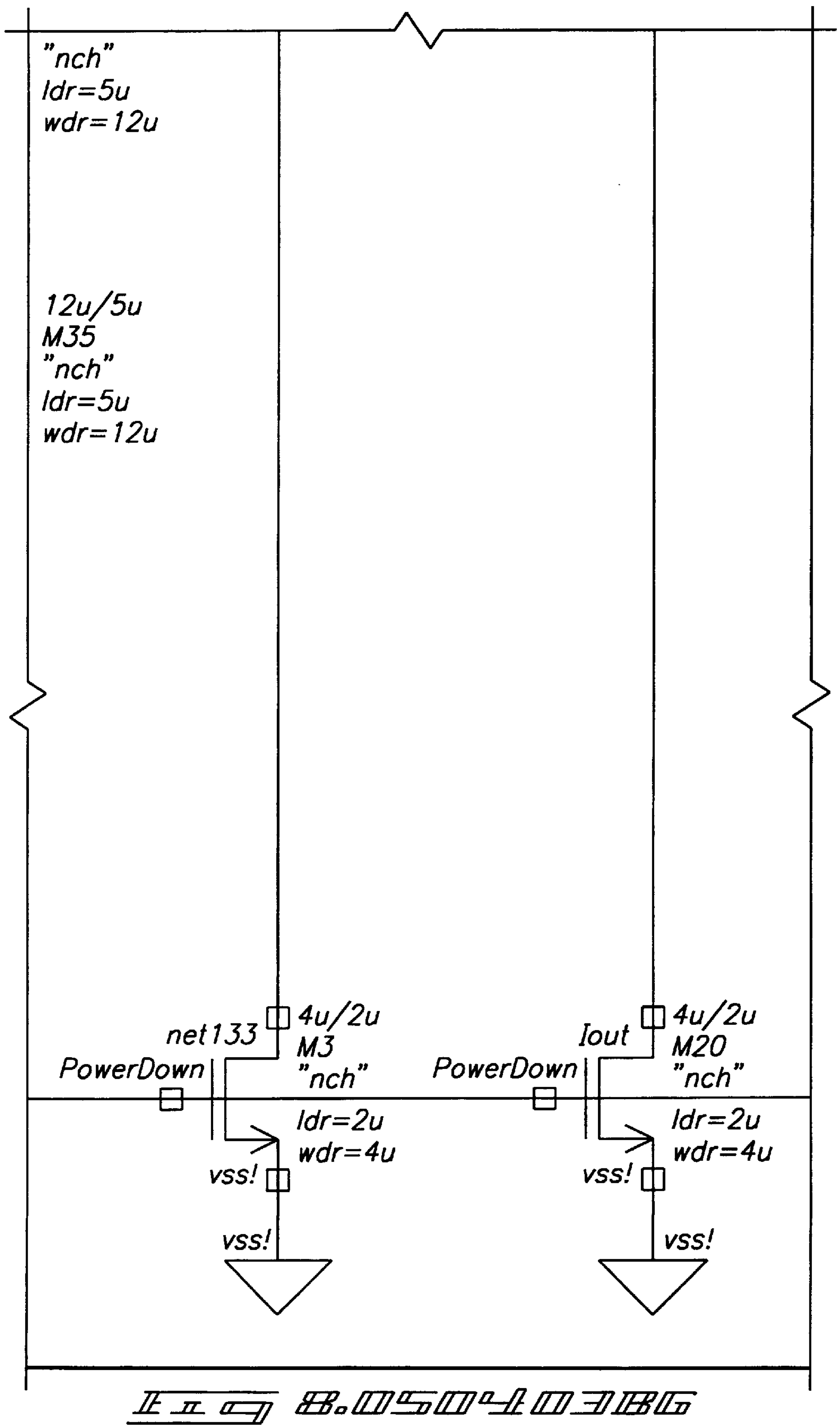
Fig 8.050403BG

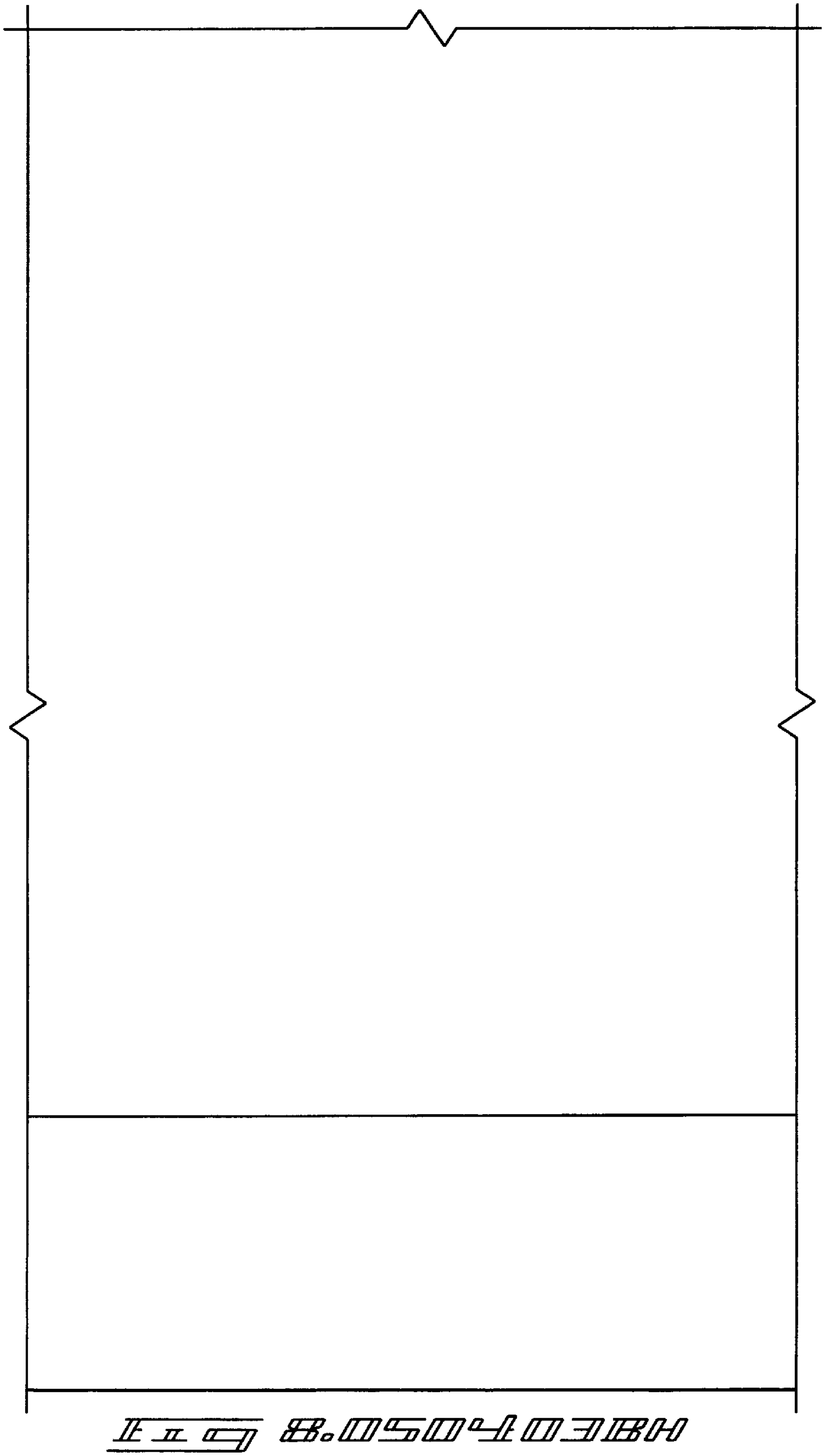
Fig 8.050403BH

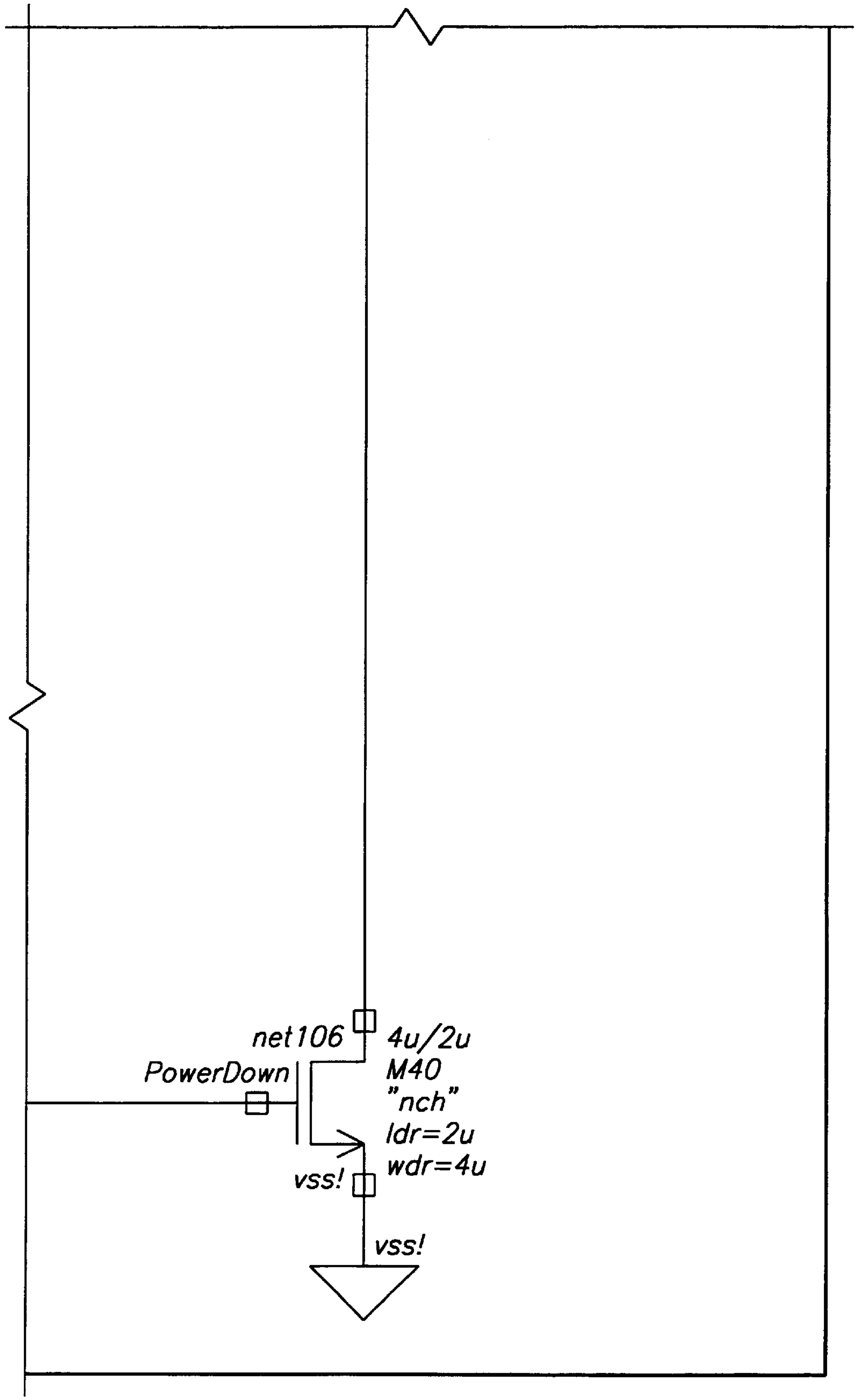
Fig 8.050403BI

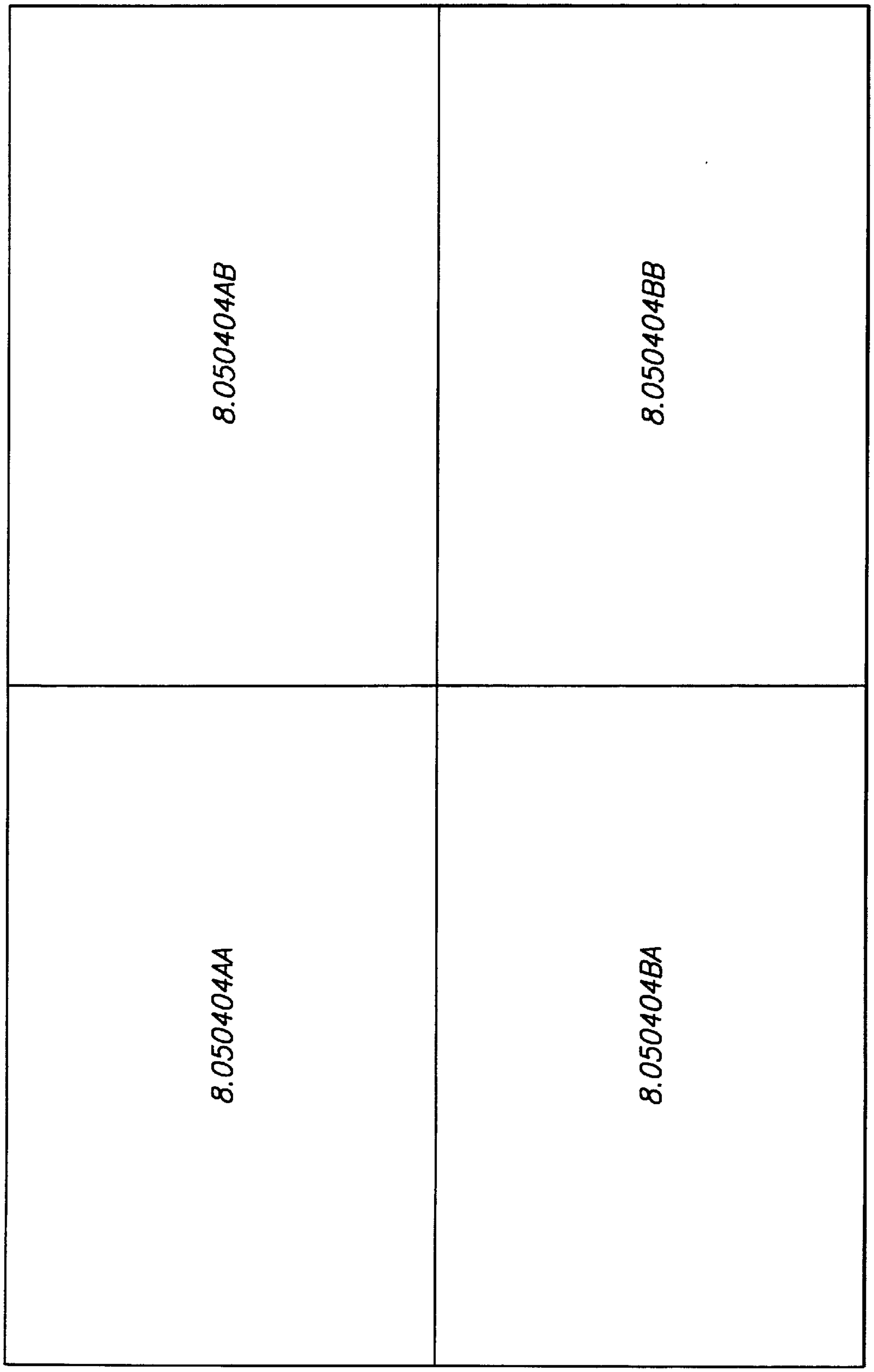
Fig. 8.050404

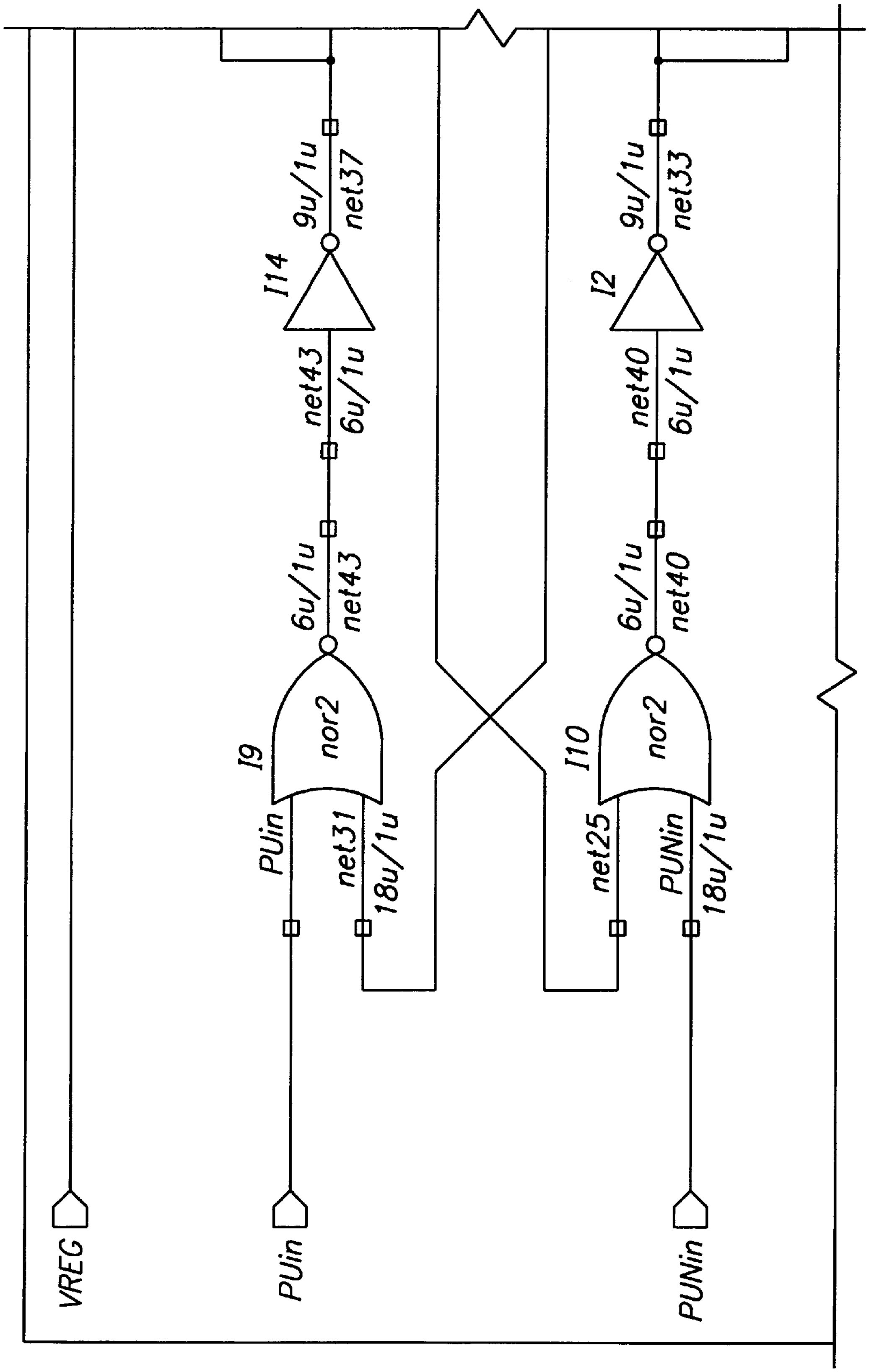
FIG. 8.050.1.0.1.4AA

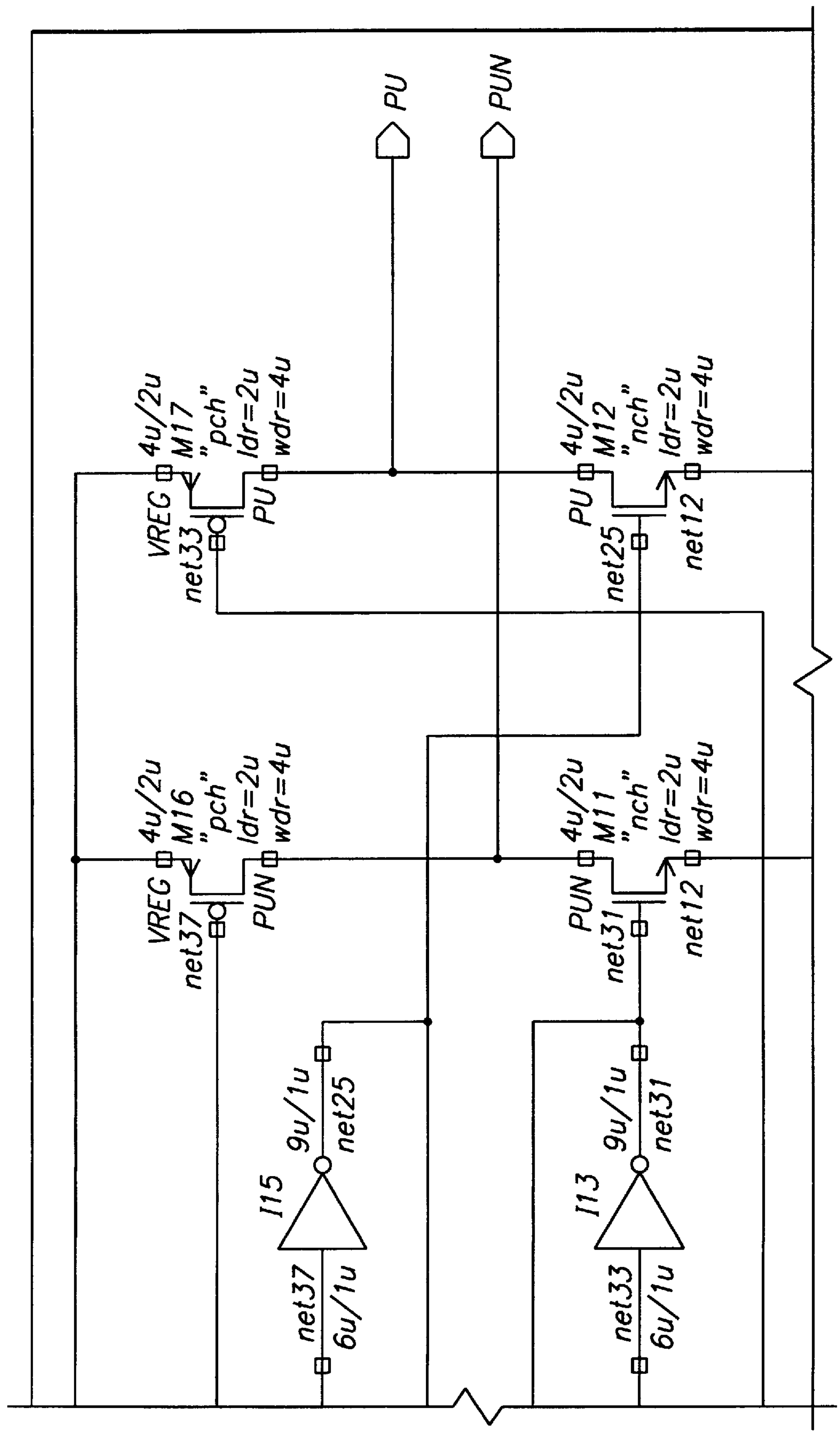
Fig 8.050404AB

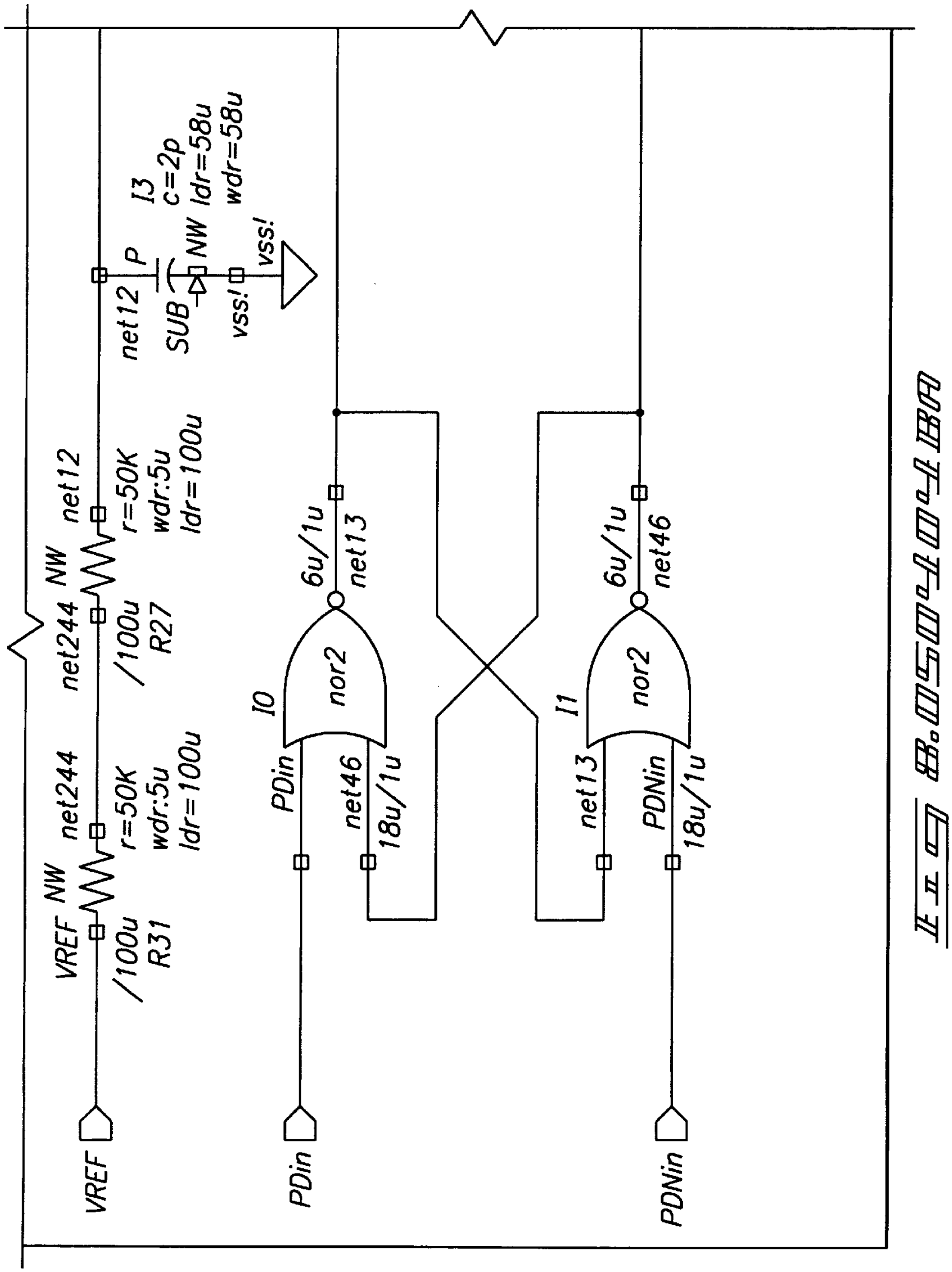
Fig. 8.05.04.04.1BA

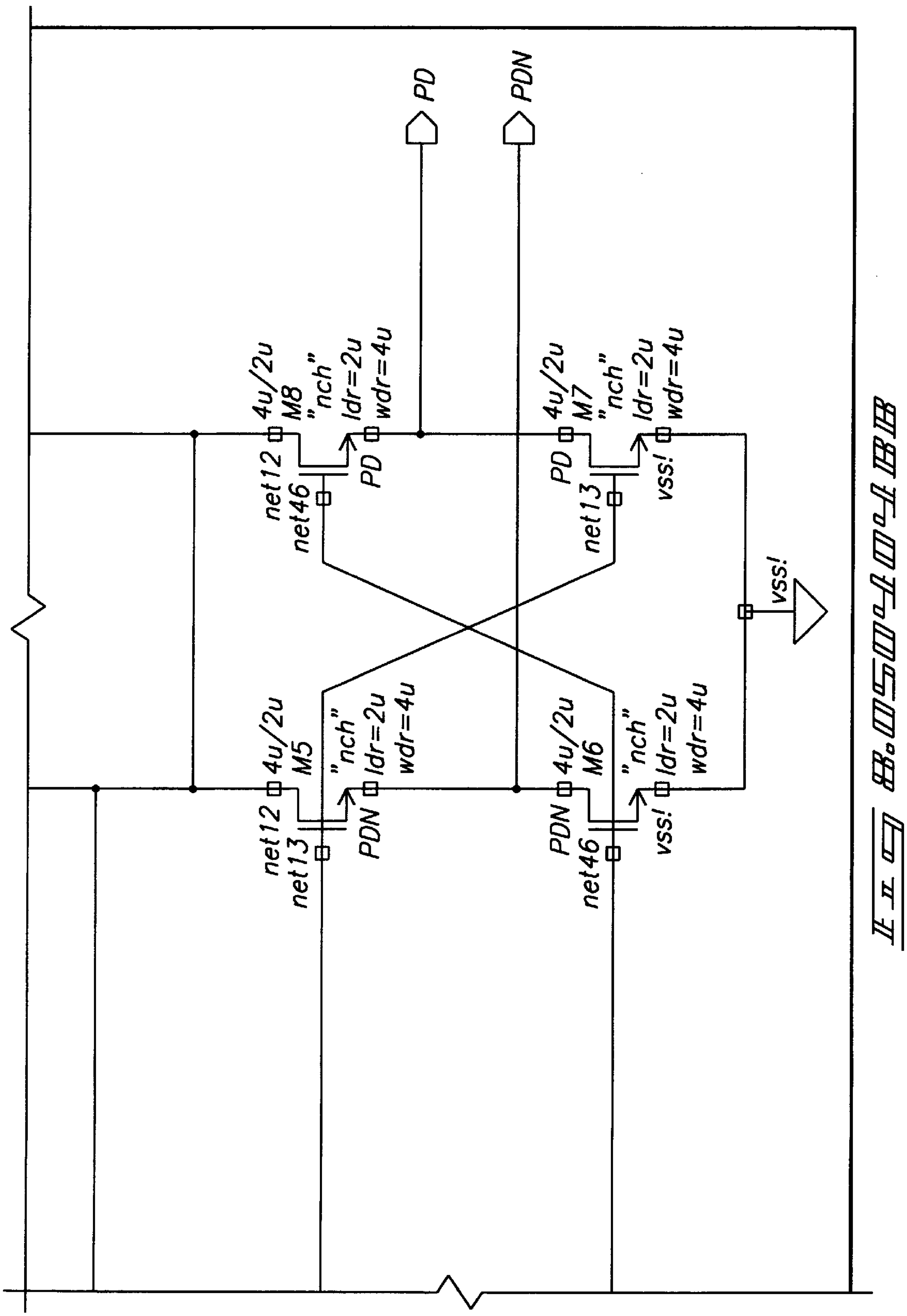
Fig. 8.050404BB

| | | | | | | | | | | | | |
|---|---|---|---|---|---|---|---|---|---|---|---|---|
| 8.050405AA | 8.050405AB | 8.050405AC | 8.050405AD | 8.050405AE | 8.050405AF | 8.050405AG | 8.050405AH | 8.050405AI | 8.050405AJ | 8.050405AK | 8.050405AL | 8.050405AM |
| | 8.050405BB | 8.050405BC | 8.050405BD | 8.050405BE | 8.050405BF | 8.050405BG | 8.050405BH | 8.050405BI | 8.050405BJ | 8.050405BK | 8.050405BL | 8.050405BM |
| 8.050405CA | 8.050405CB | 8.050405CC | 8.050405CD | 8.050405CE | 8.050405CF | 8.050405CG | 8.050405CH | 8.050405CI | 8.050405CJ | 8.050405CK | 8.050405CL | 8.050405CM |
| 8.050405DA | 8.050405DB | 8.050405DC | 8.050405DD | 8.050405DE | 8.050405DF | 8.050405DG | 8.050405DH | 8.050405DI | 8.050405DJ | | | |
| 8.050405EA | 8.050405EB | 8.050405EC | 8.050405ED | 8.050405EE | 8.050405EF | 8.050405EG | 8.050405EH | 8.050405EI | 8.050405EJ | | | |

Fig. 8.050405

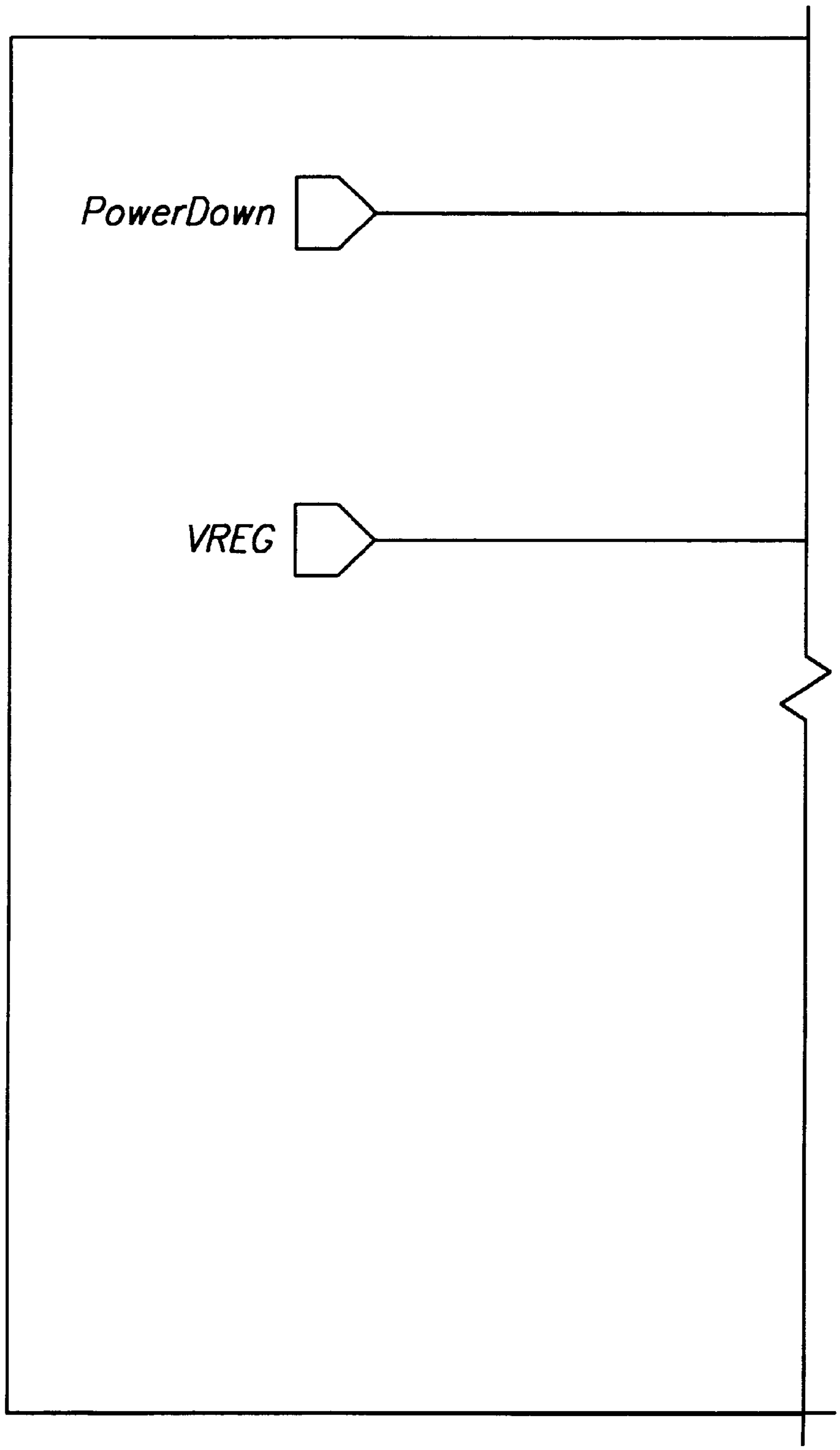
Fig 8.05040SAA

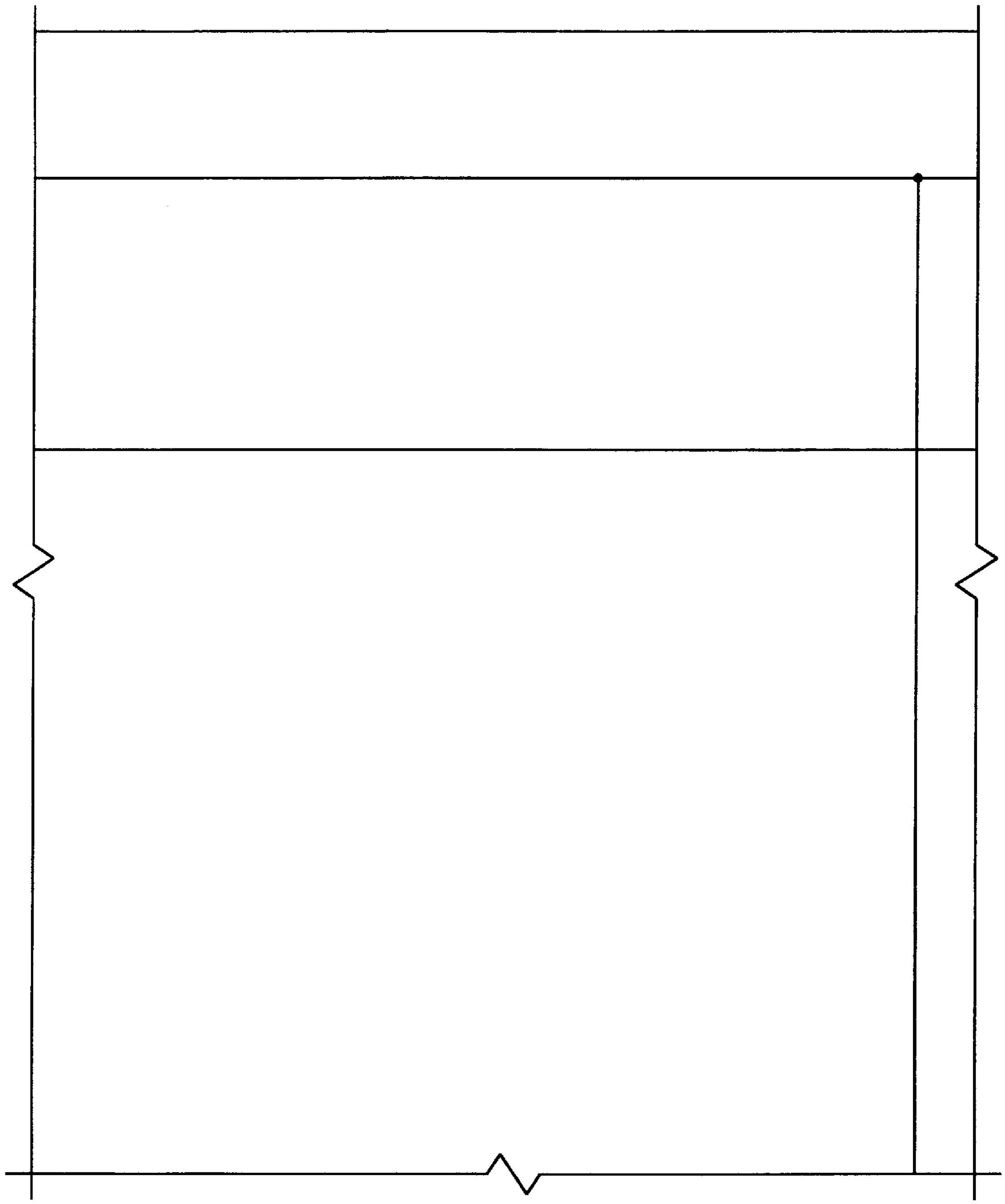
FIG 8.0504.05AB

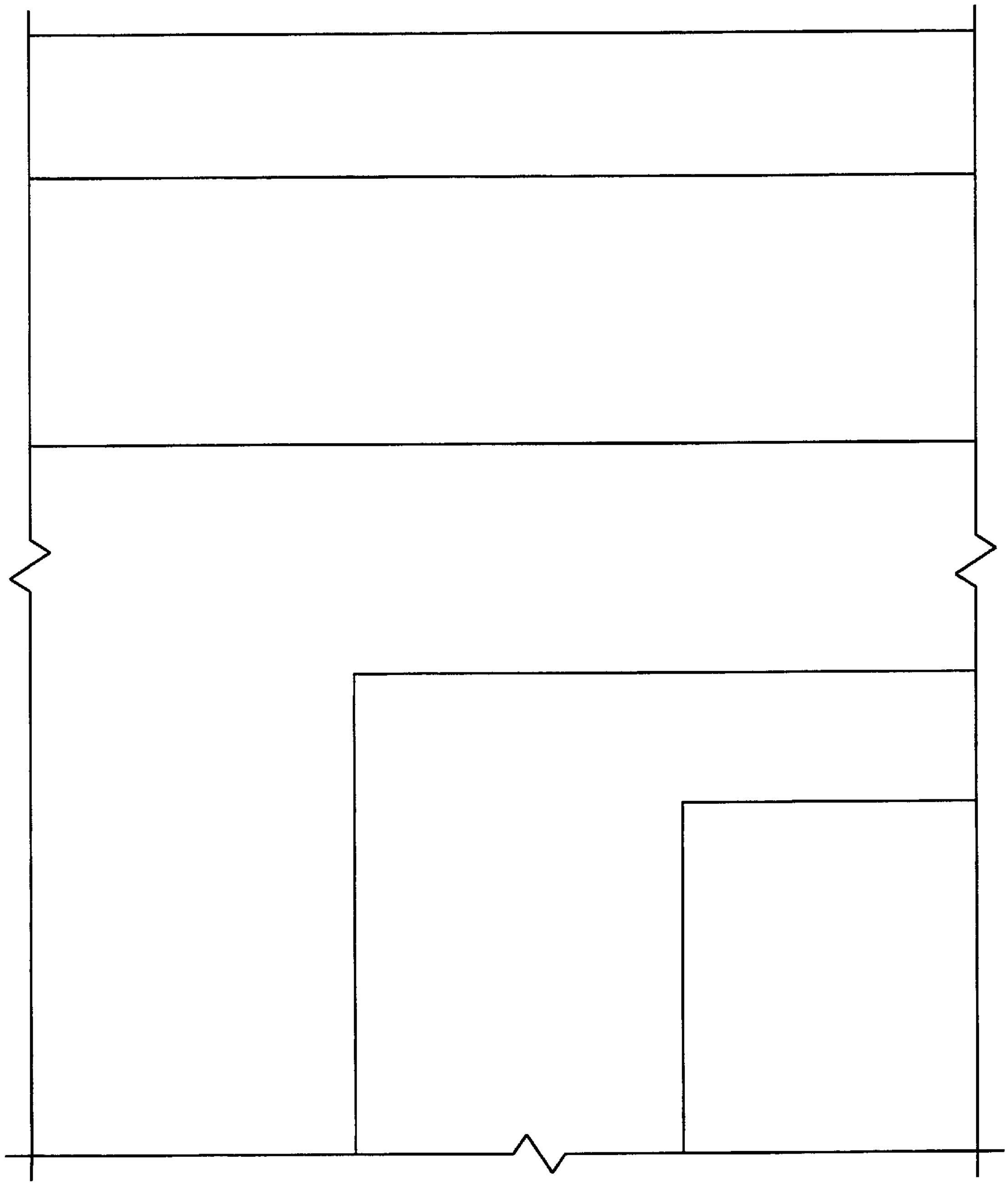
Fig 8.0504.05AC

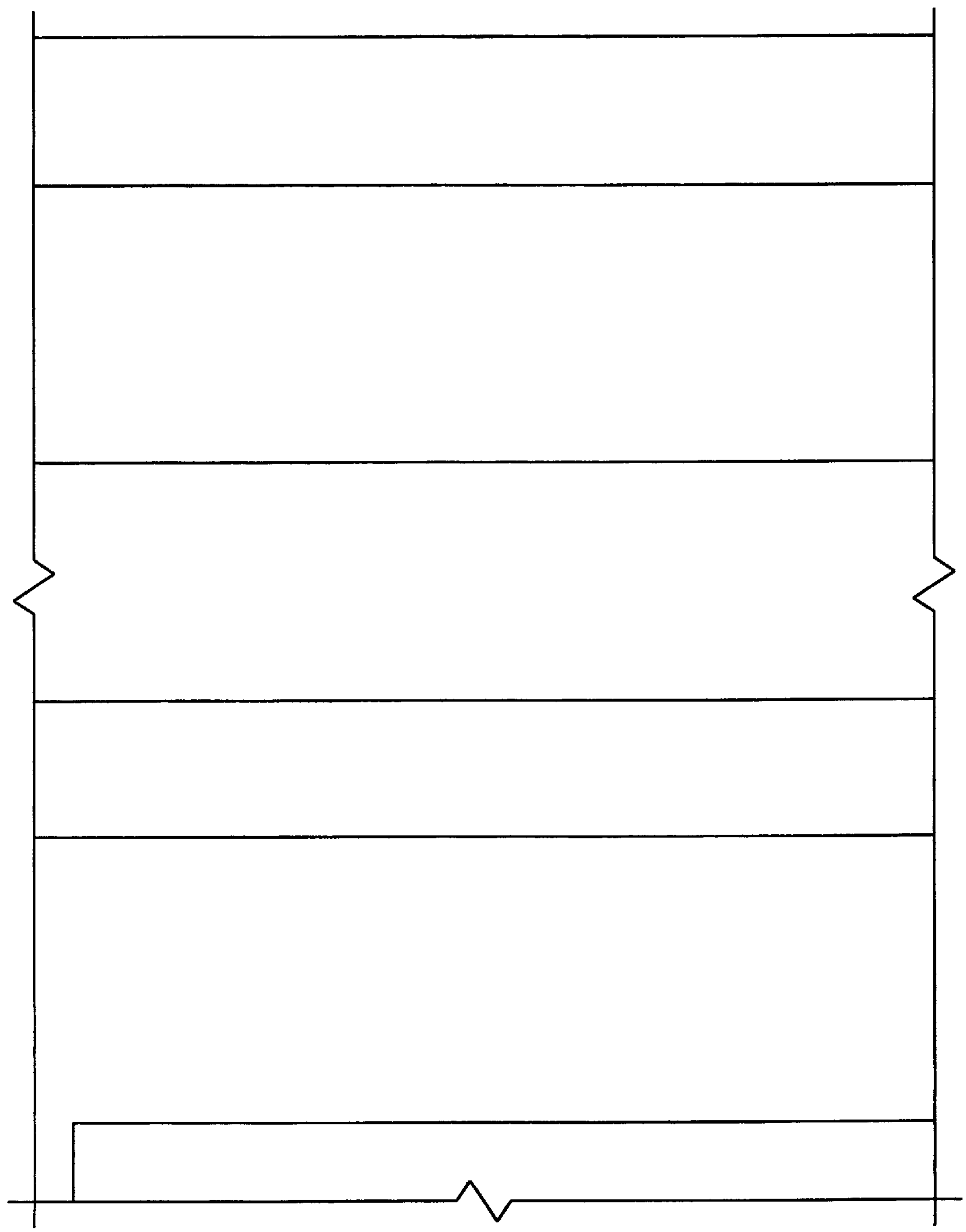
Fig 8.050405AD

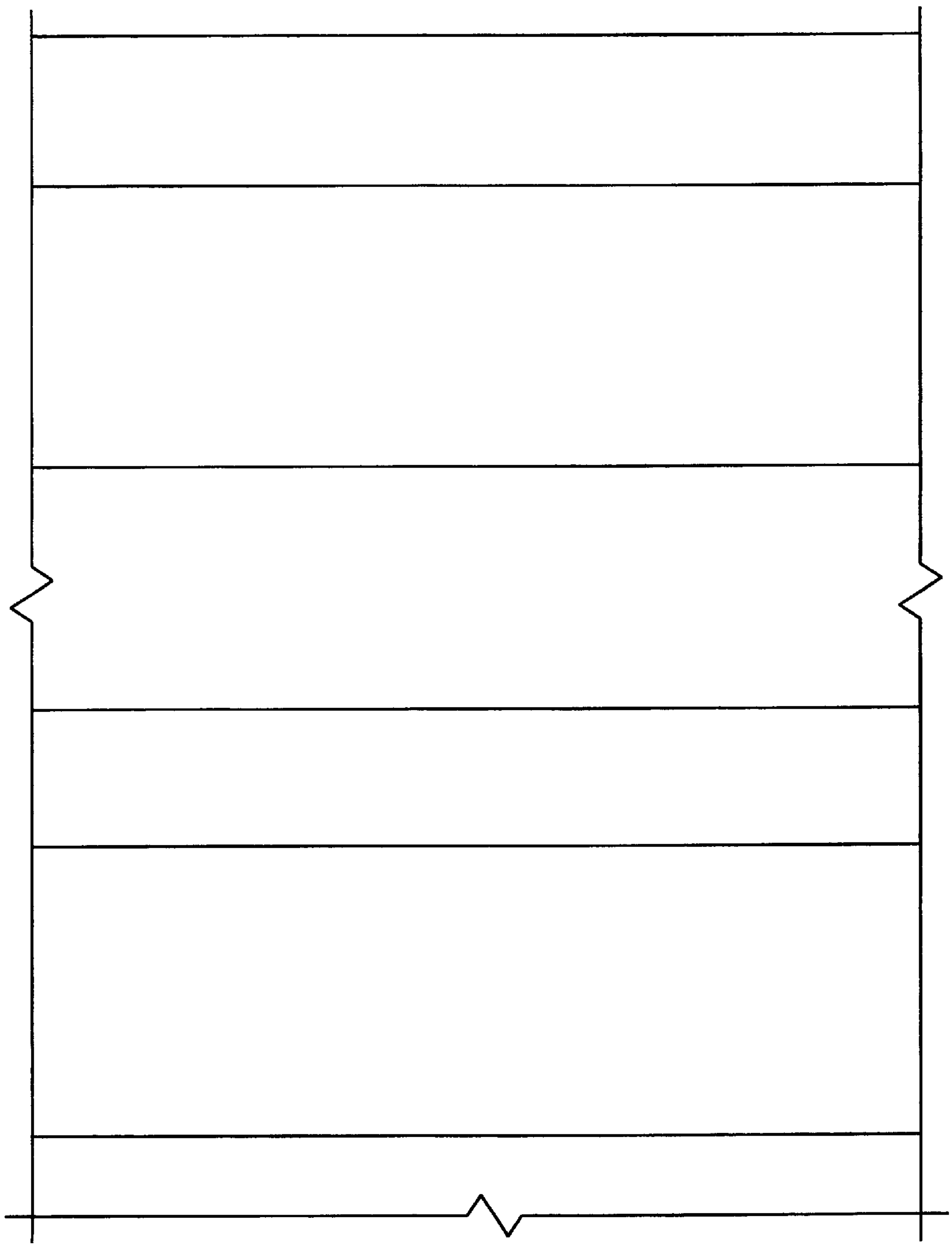
FIG 8.0504O5AE

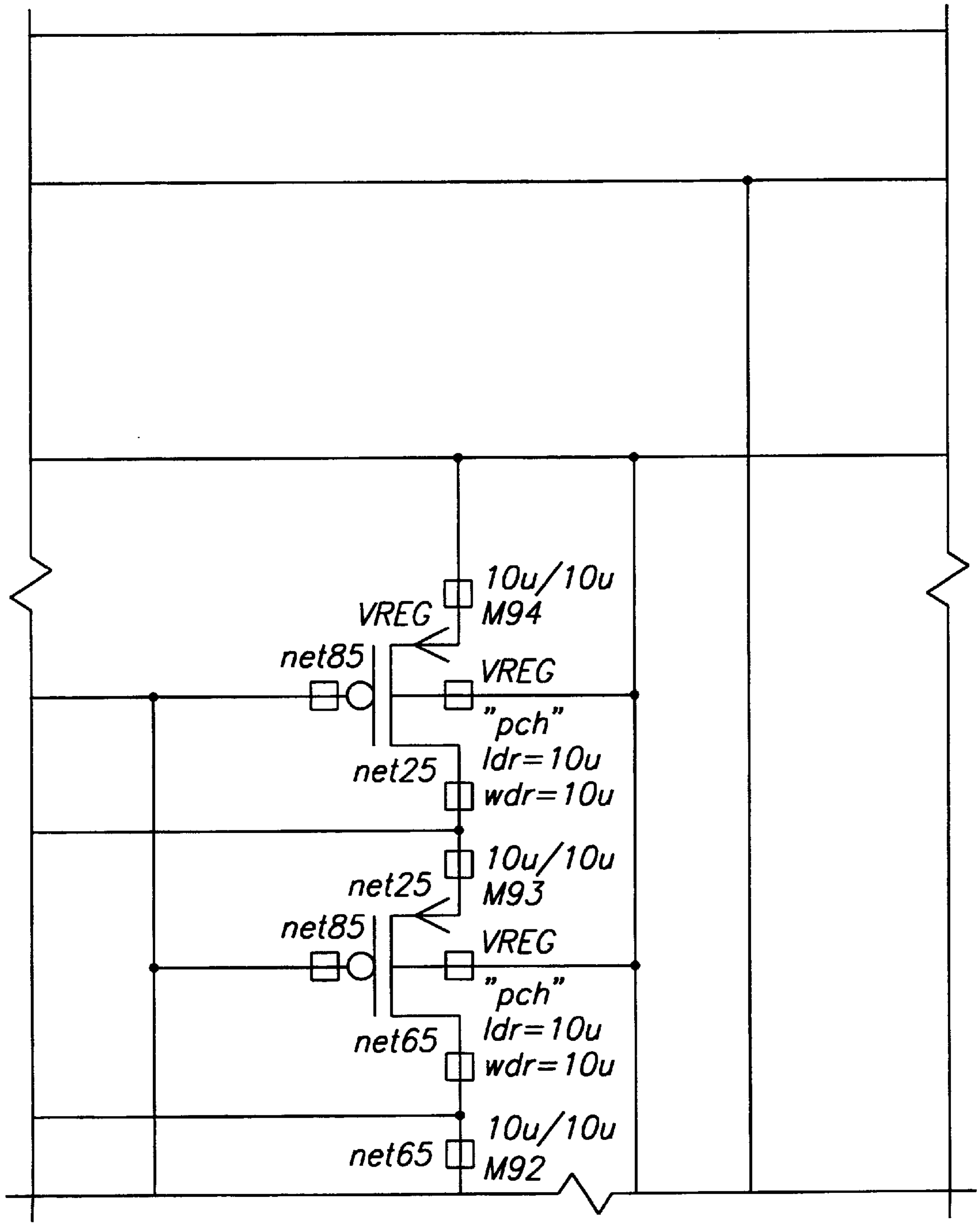
Fig 8.050405AF

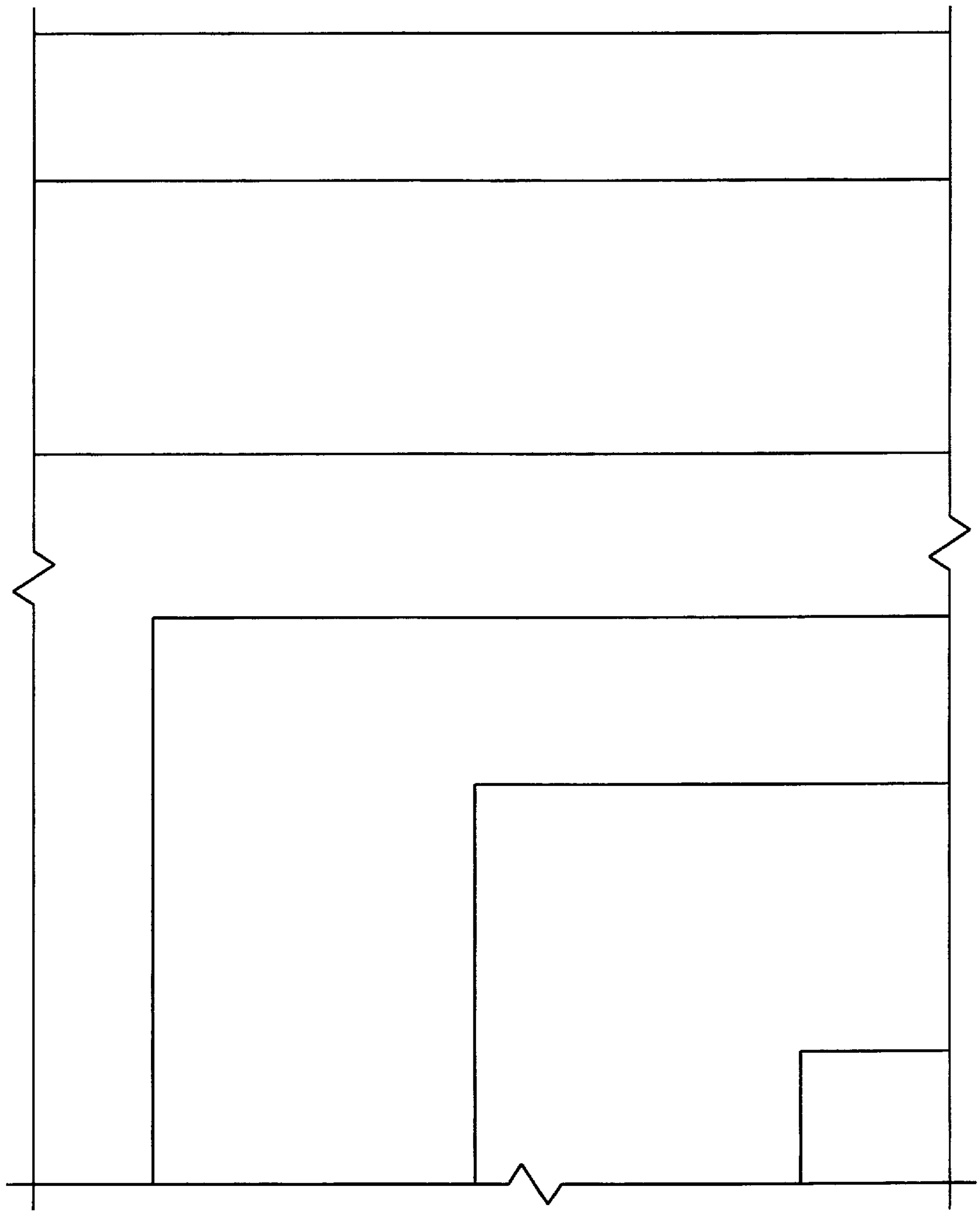
Fig 8.0504OSAG

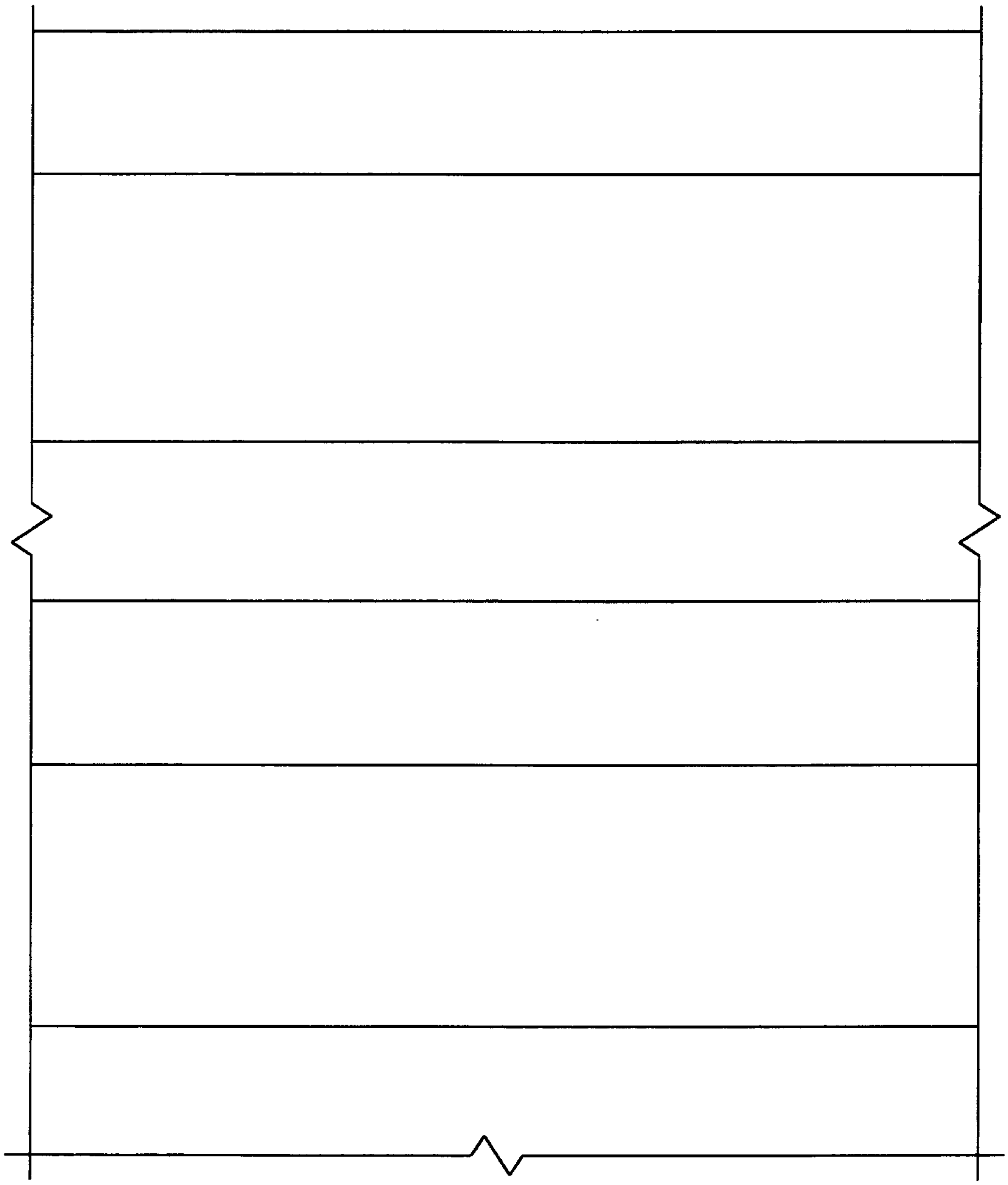
Fig 8.05040SAH

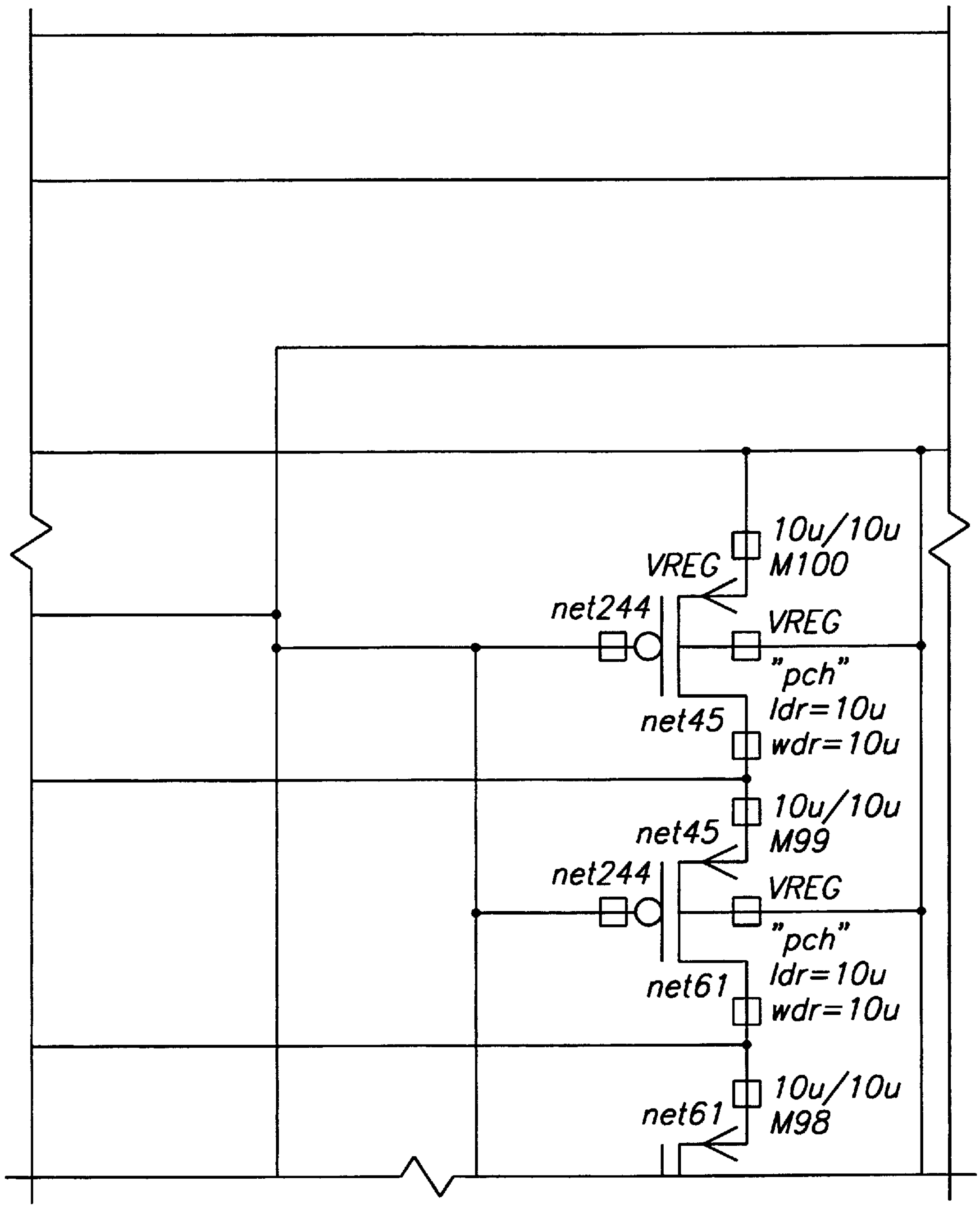
Fig 8.050405A1

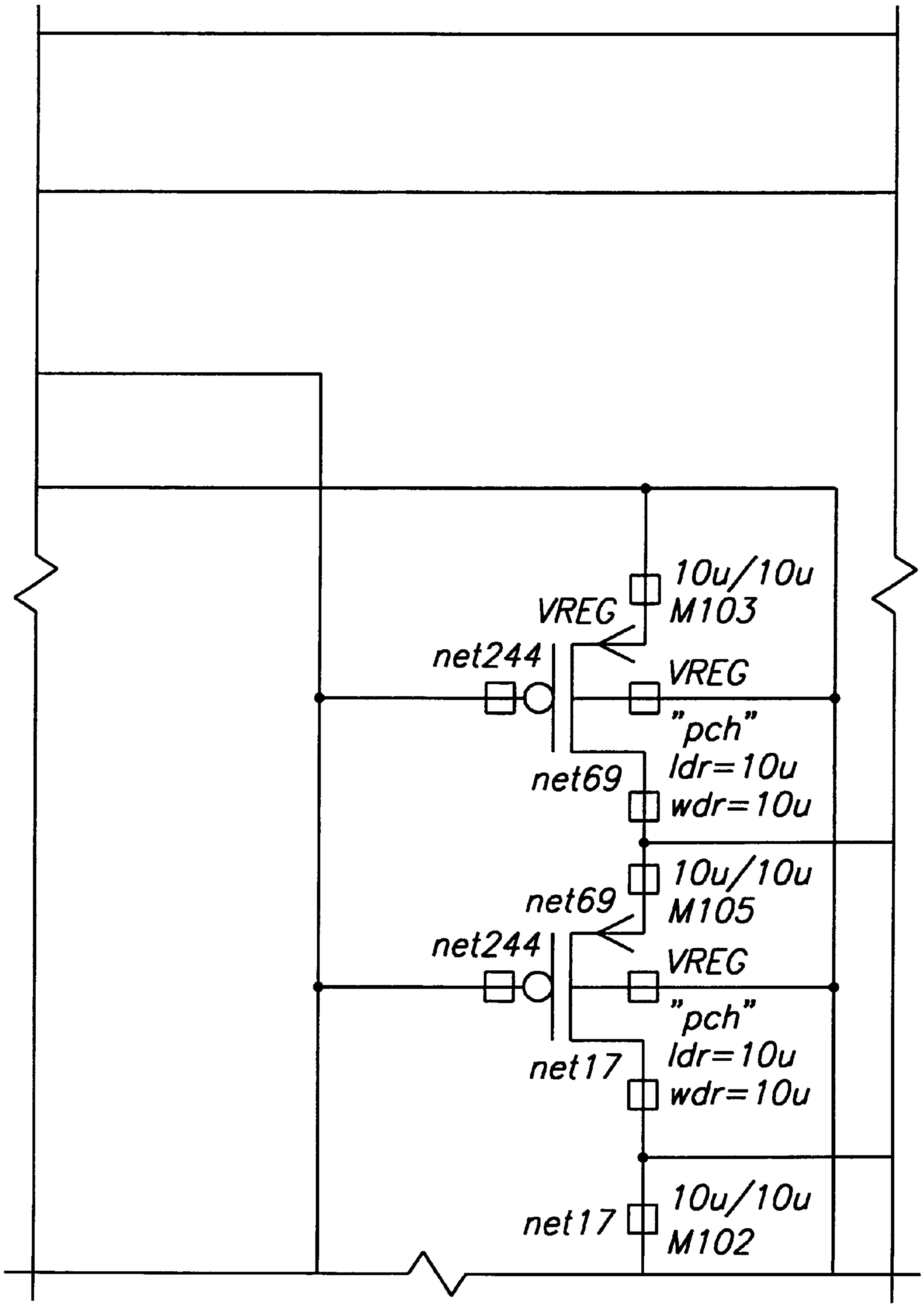
FIG 8.050405A.1

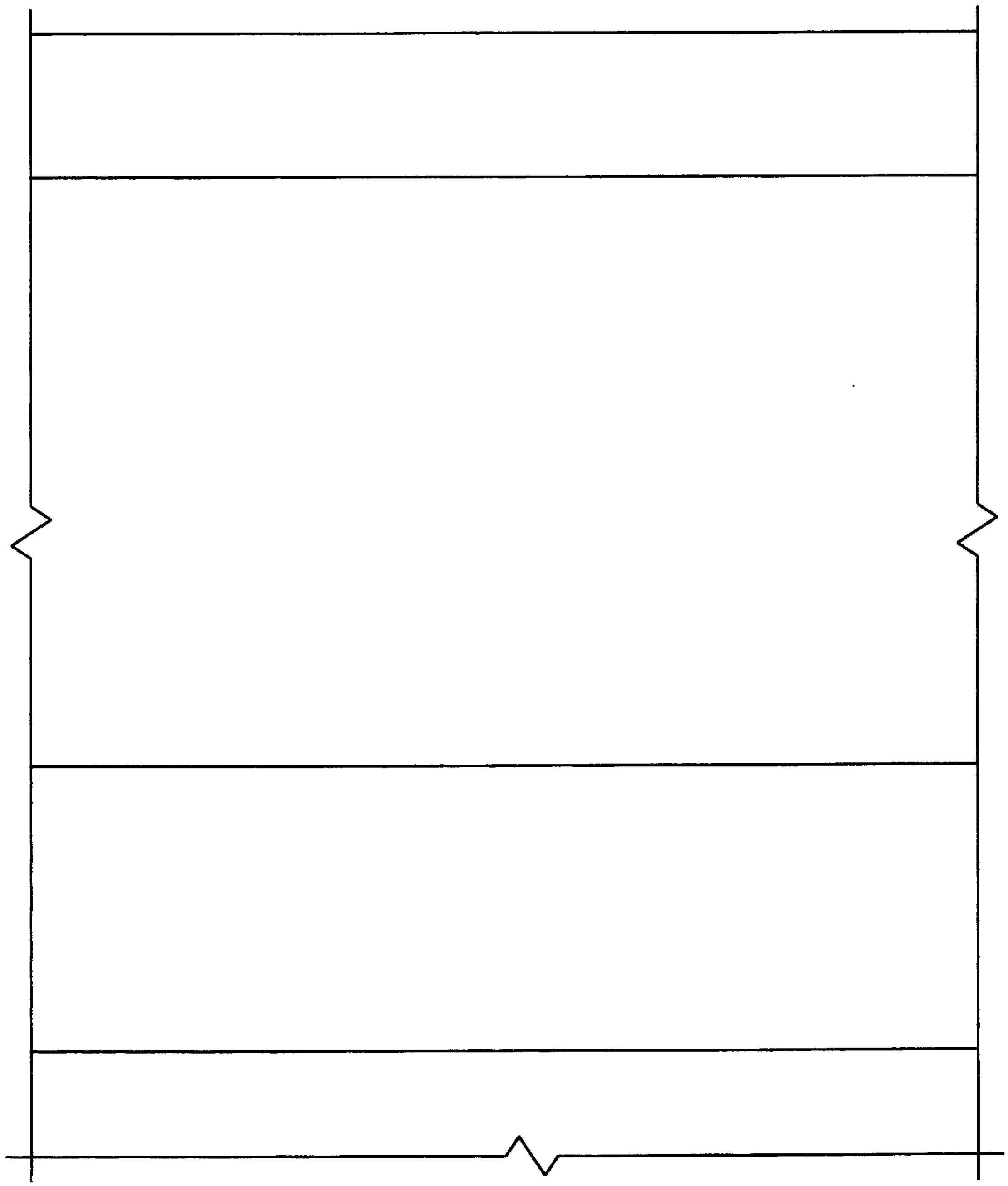
Fig 8.05040SAK

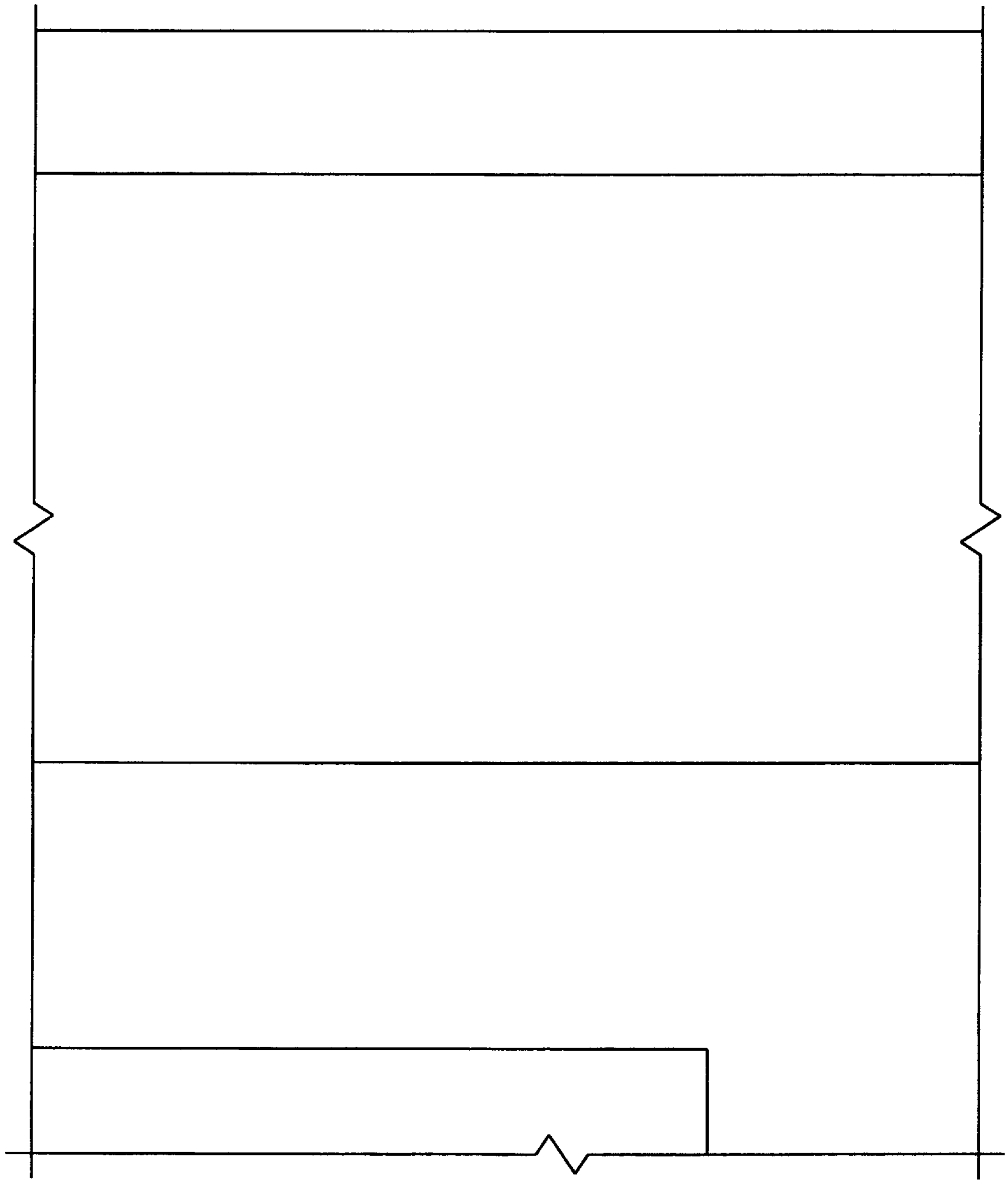
Fig 8.05040SAL

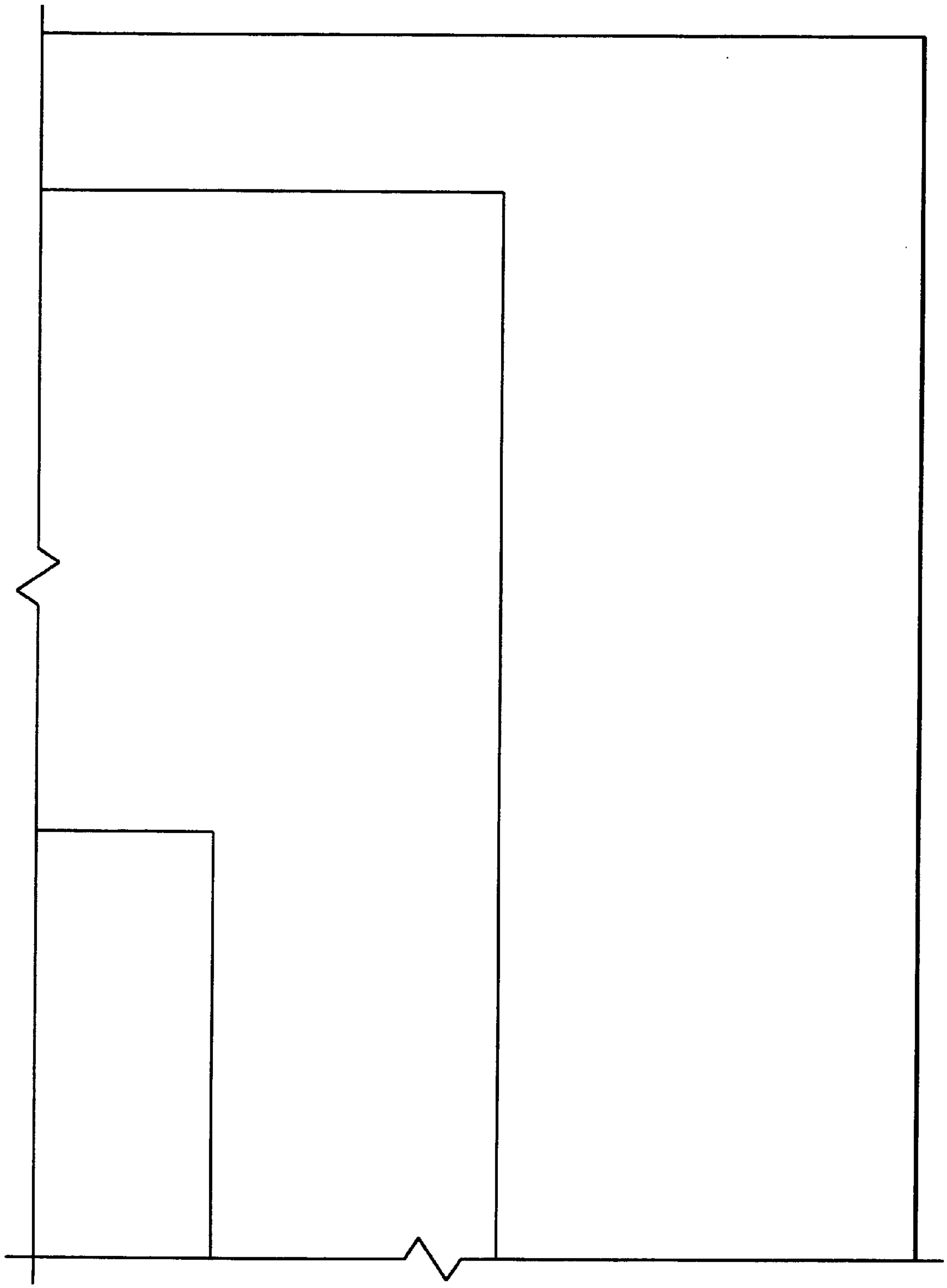
Fig 8.050405AM

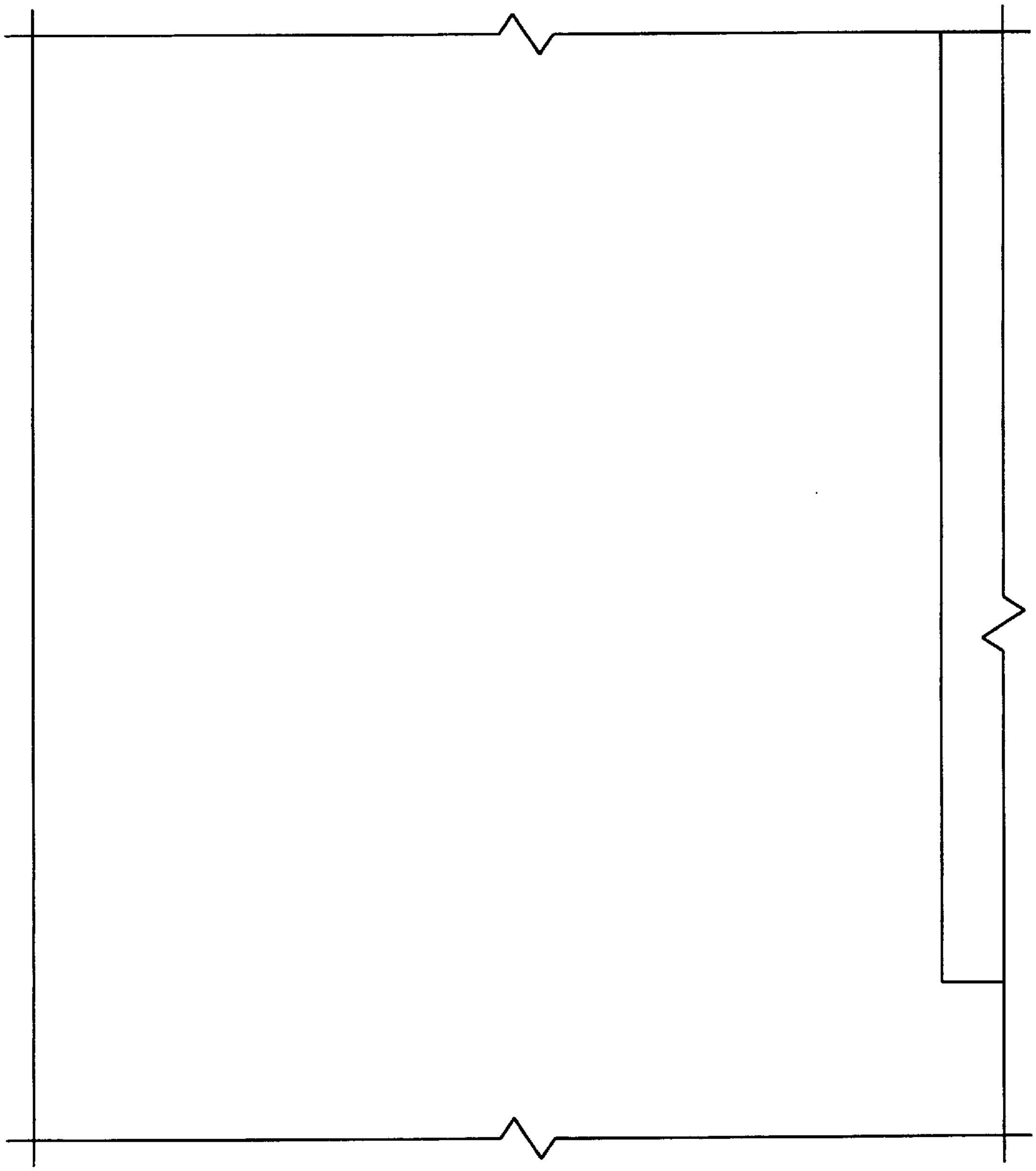
Fig 8.050405BB

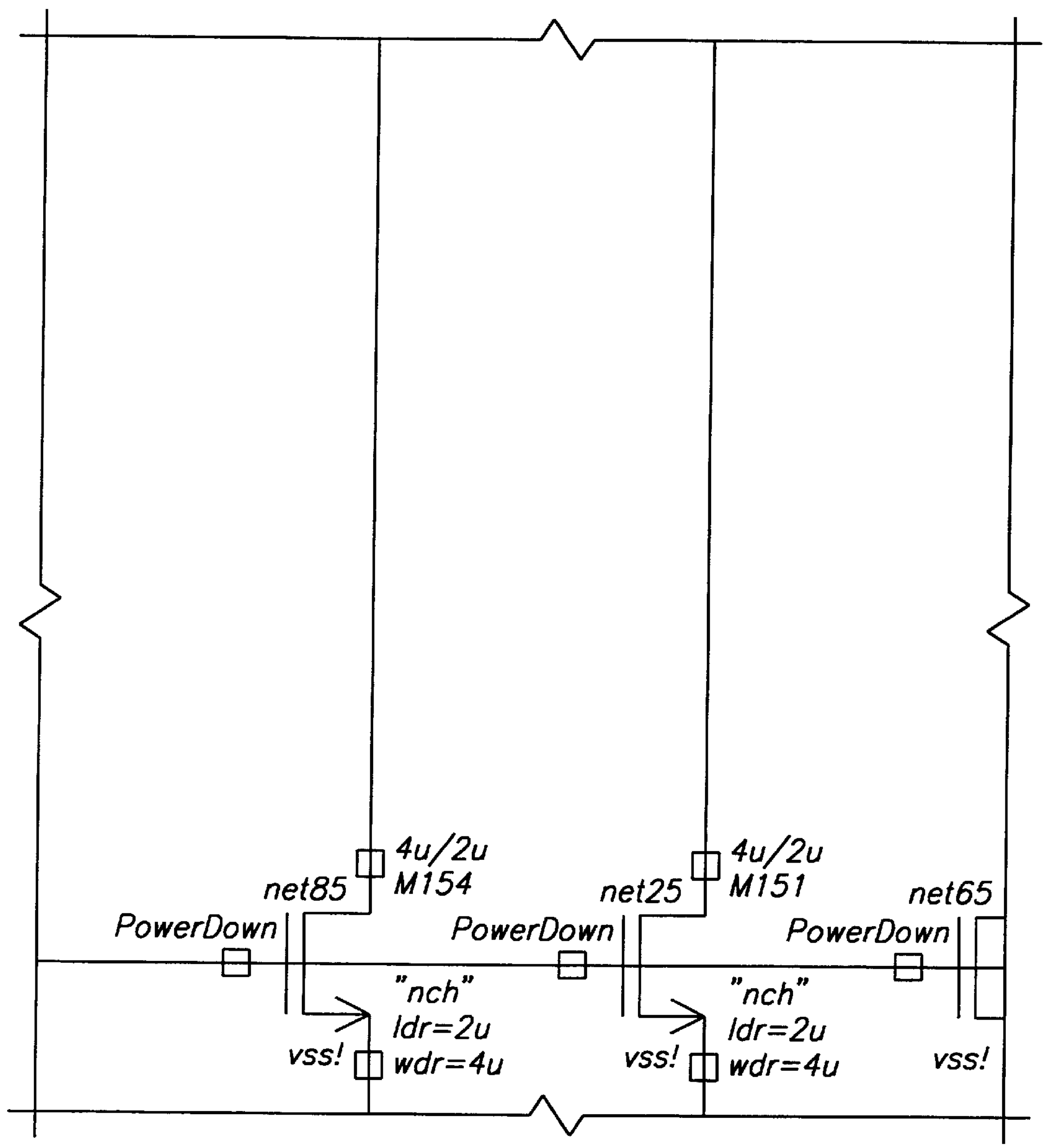
Fig 8.050405BC

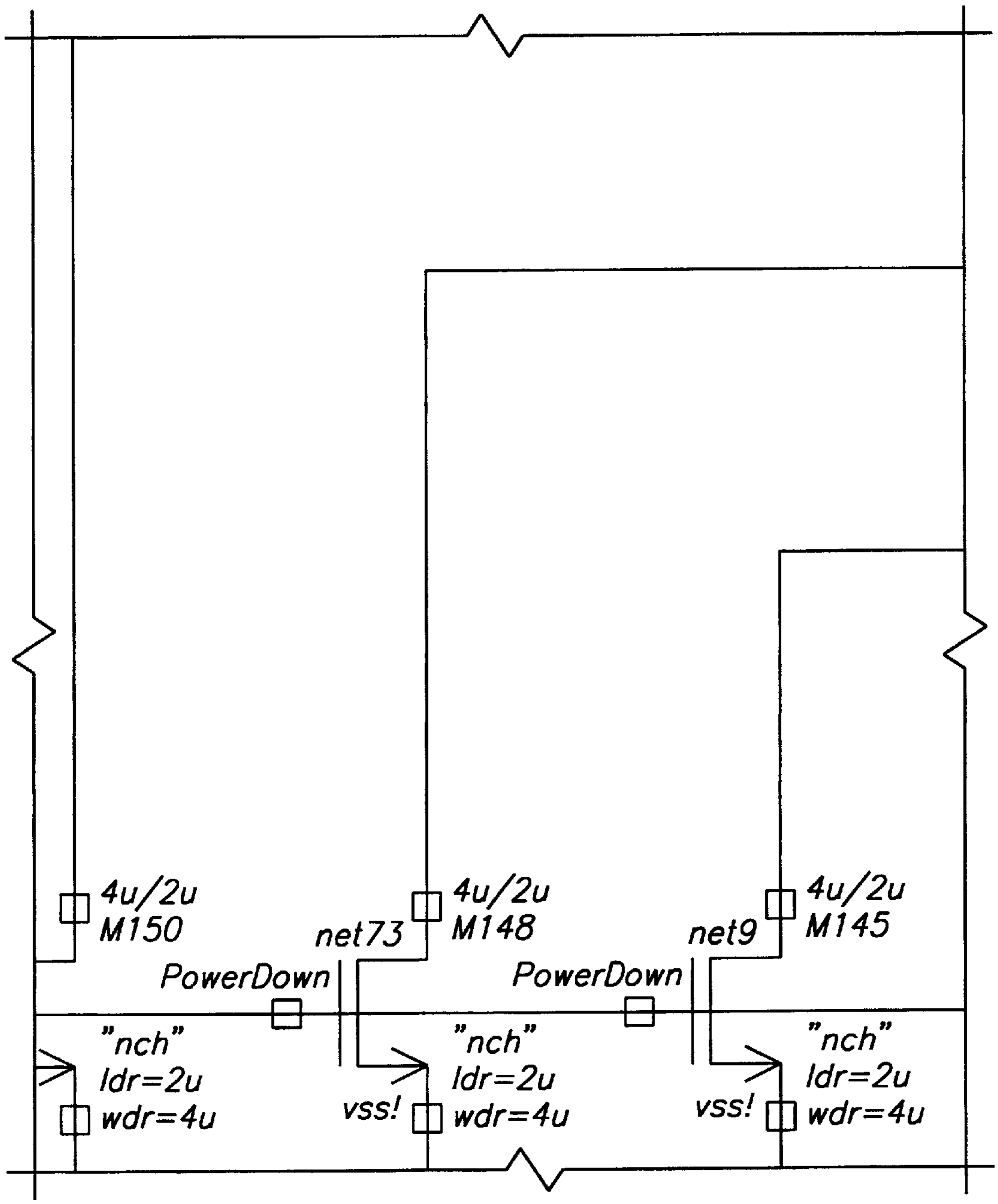
Fig. 8.050405BD

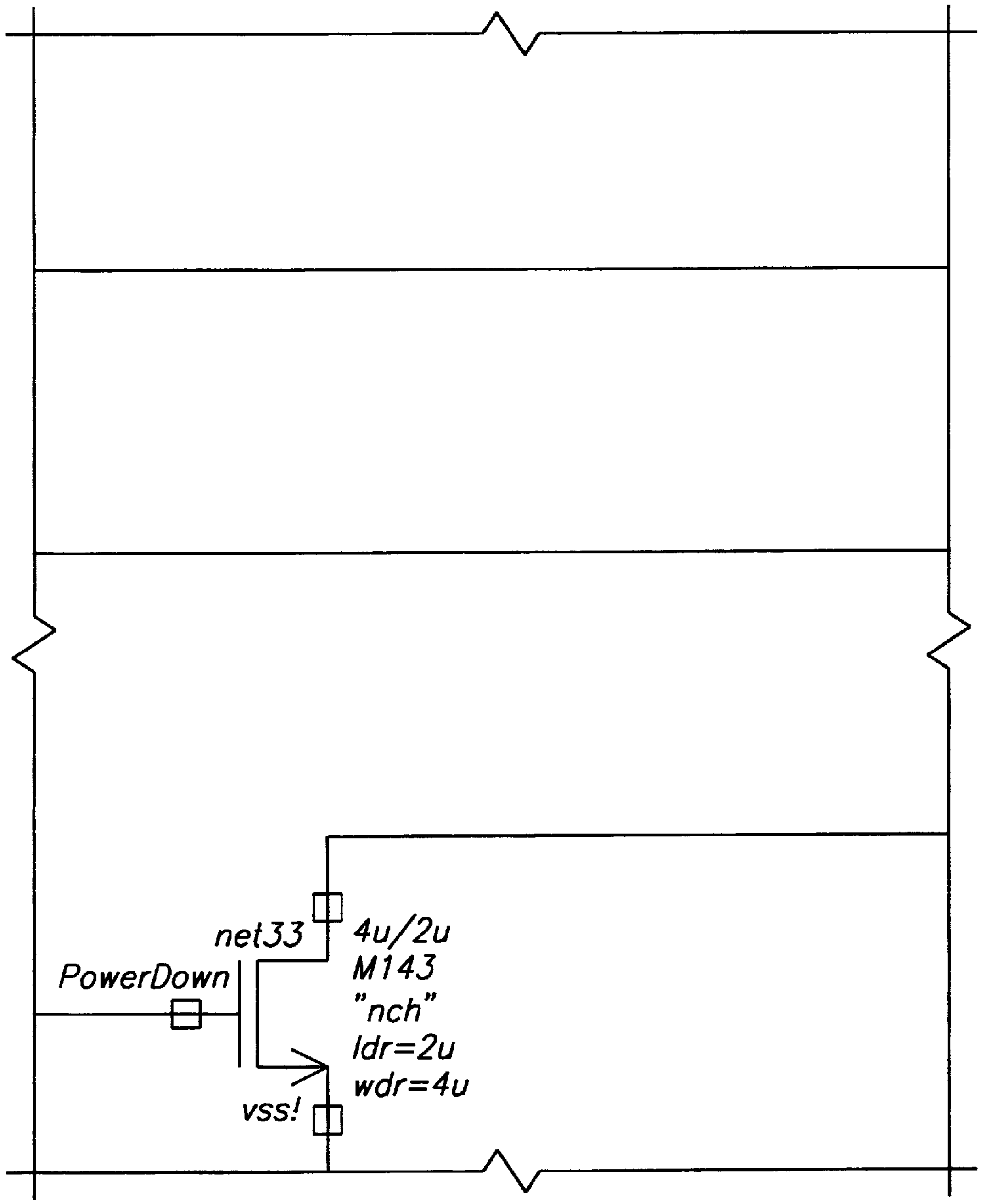
FIG. 8.050405BE

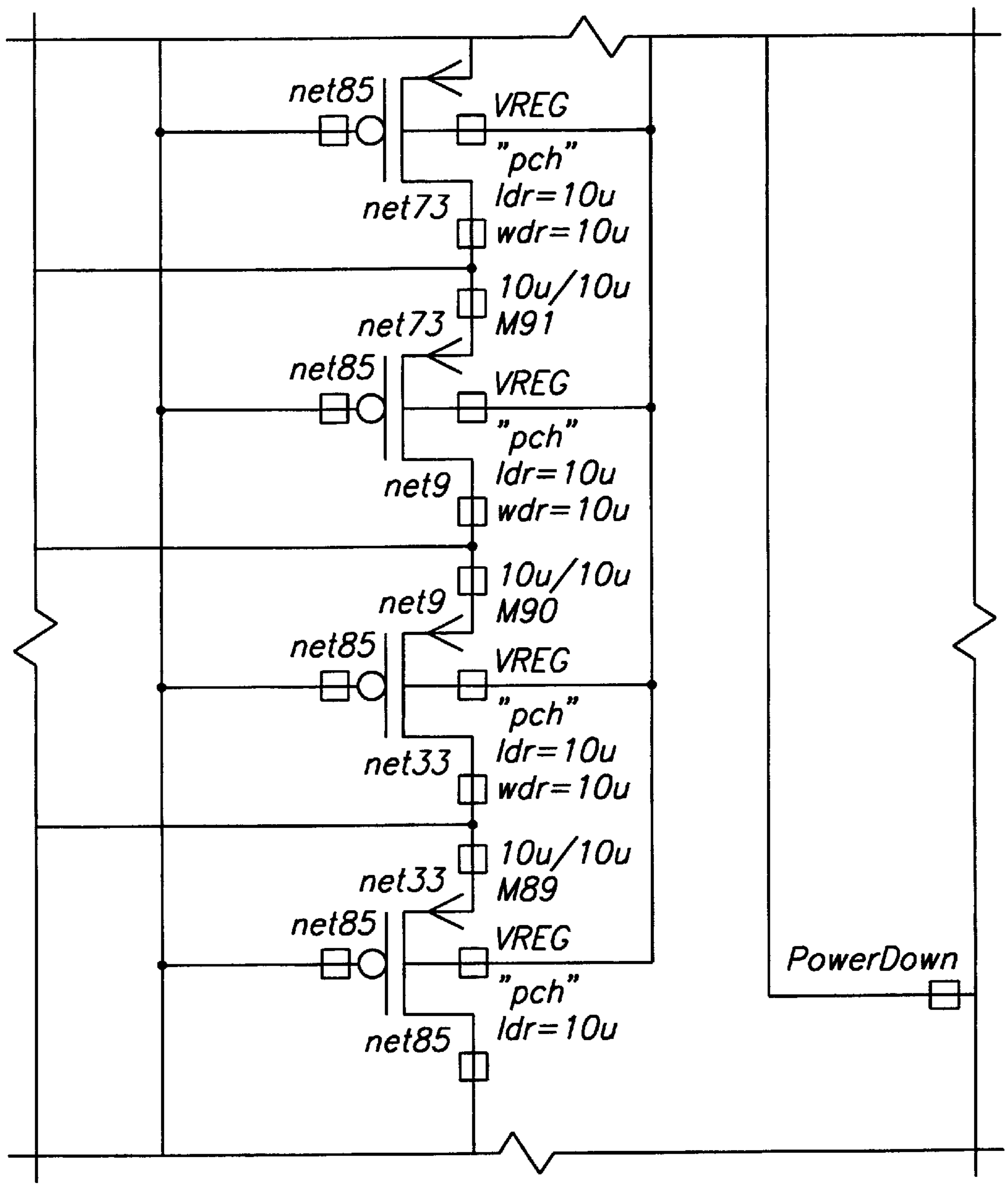
Fig 8.050405BF

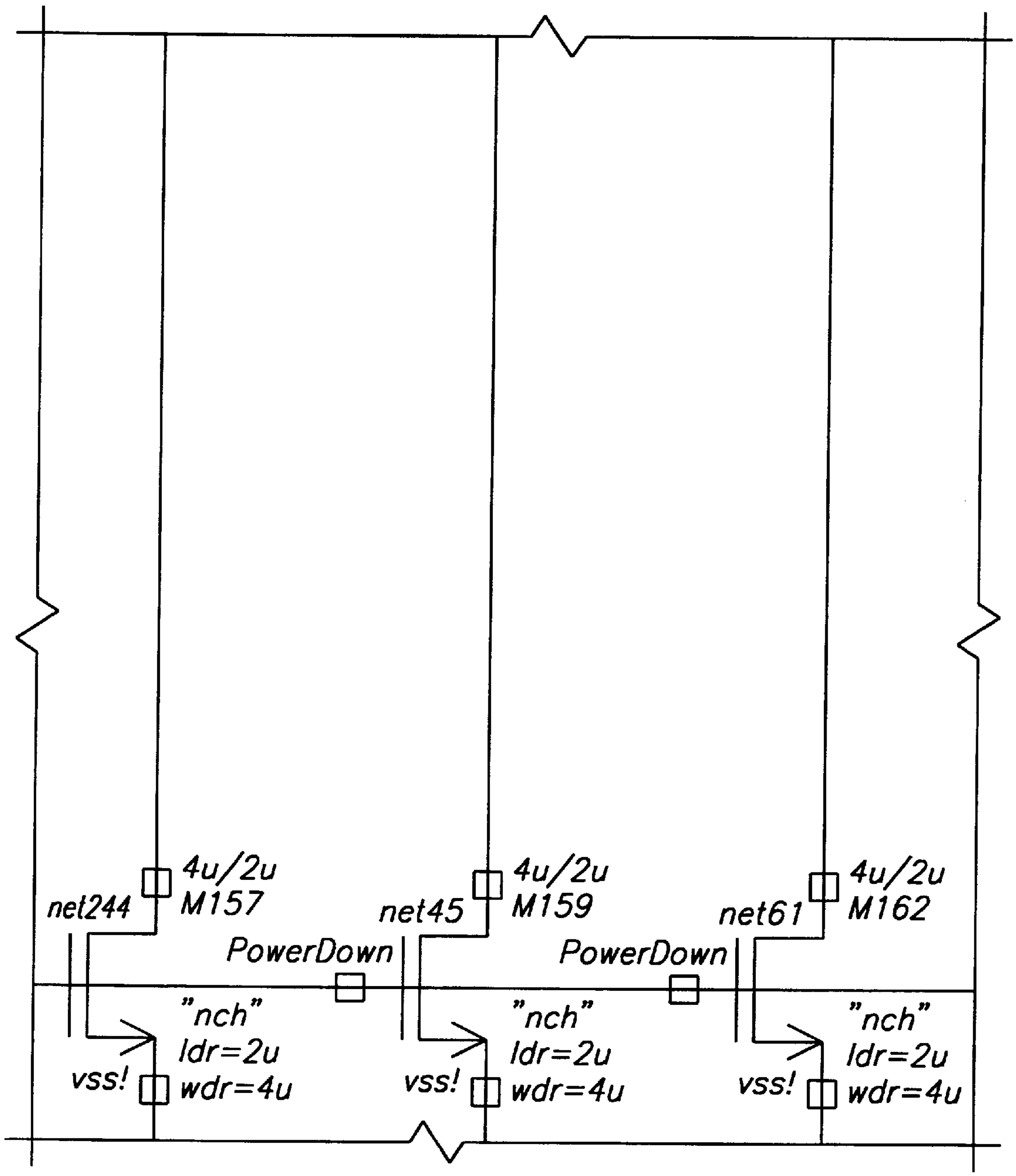
Fig 8.05040SBG

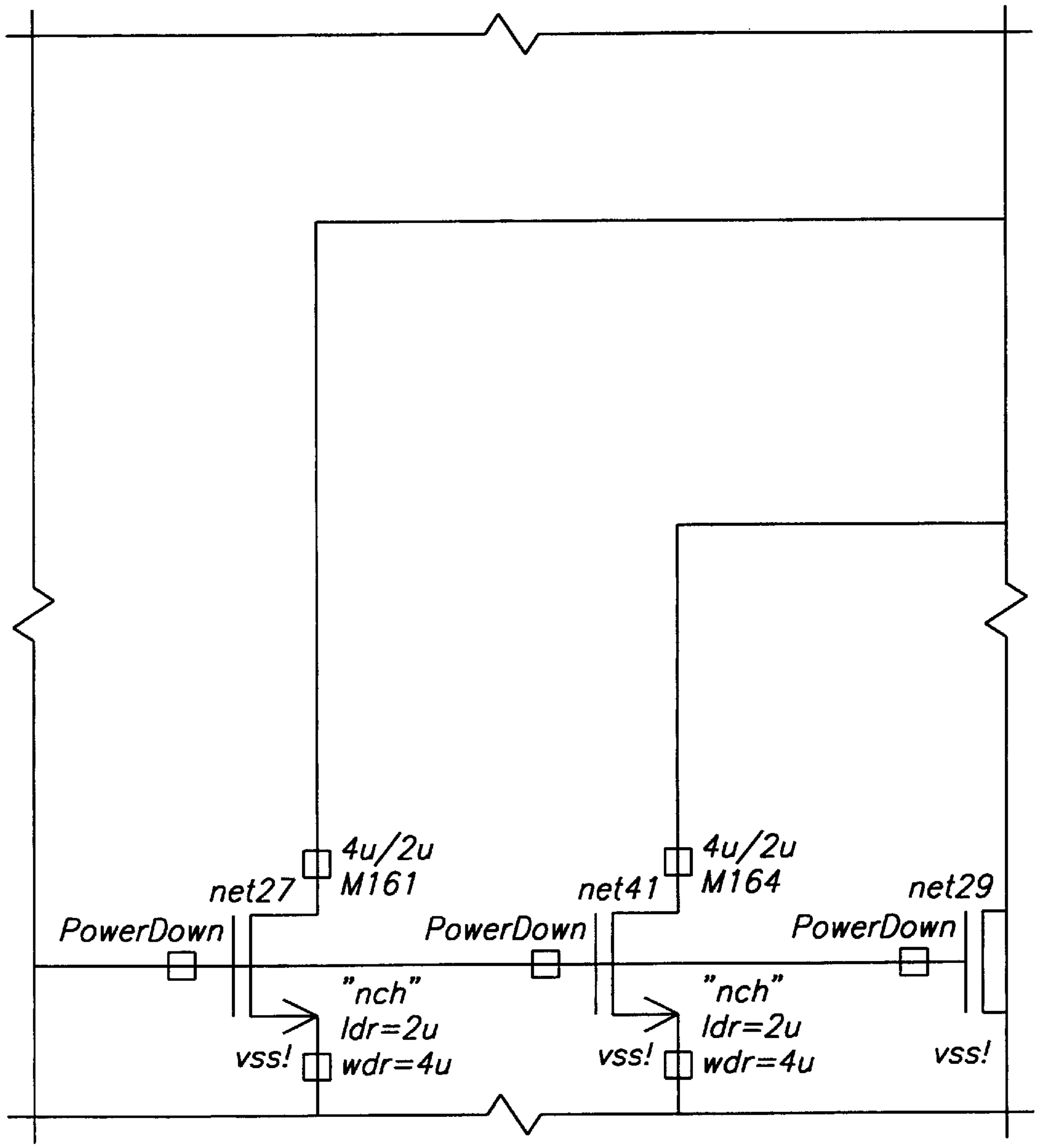
Fig. 8.050405BH

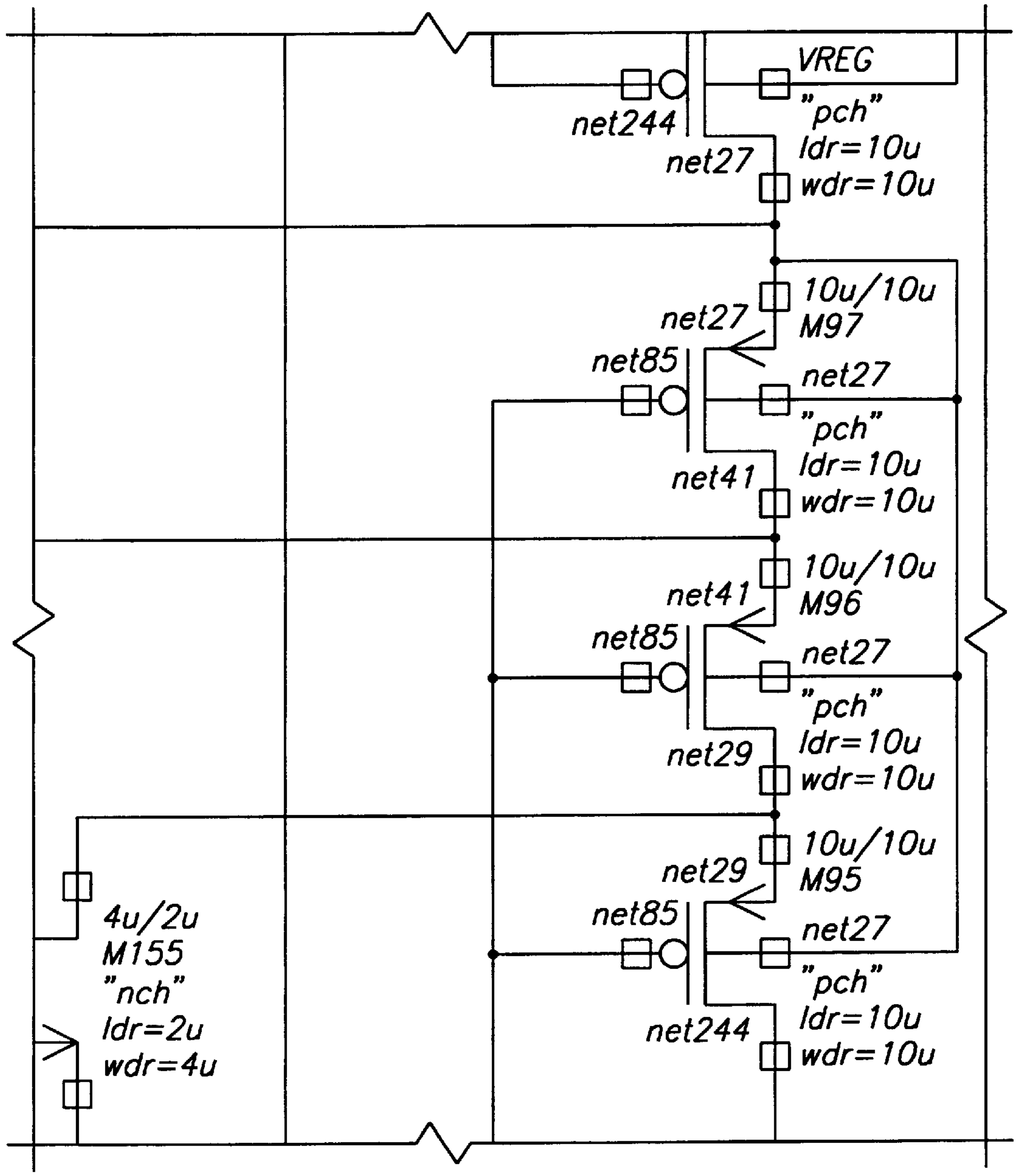
Fig 8.050405BI

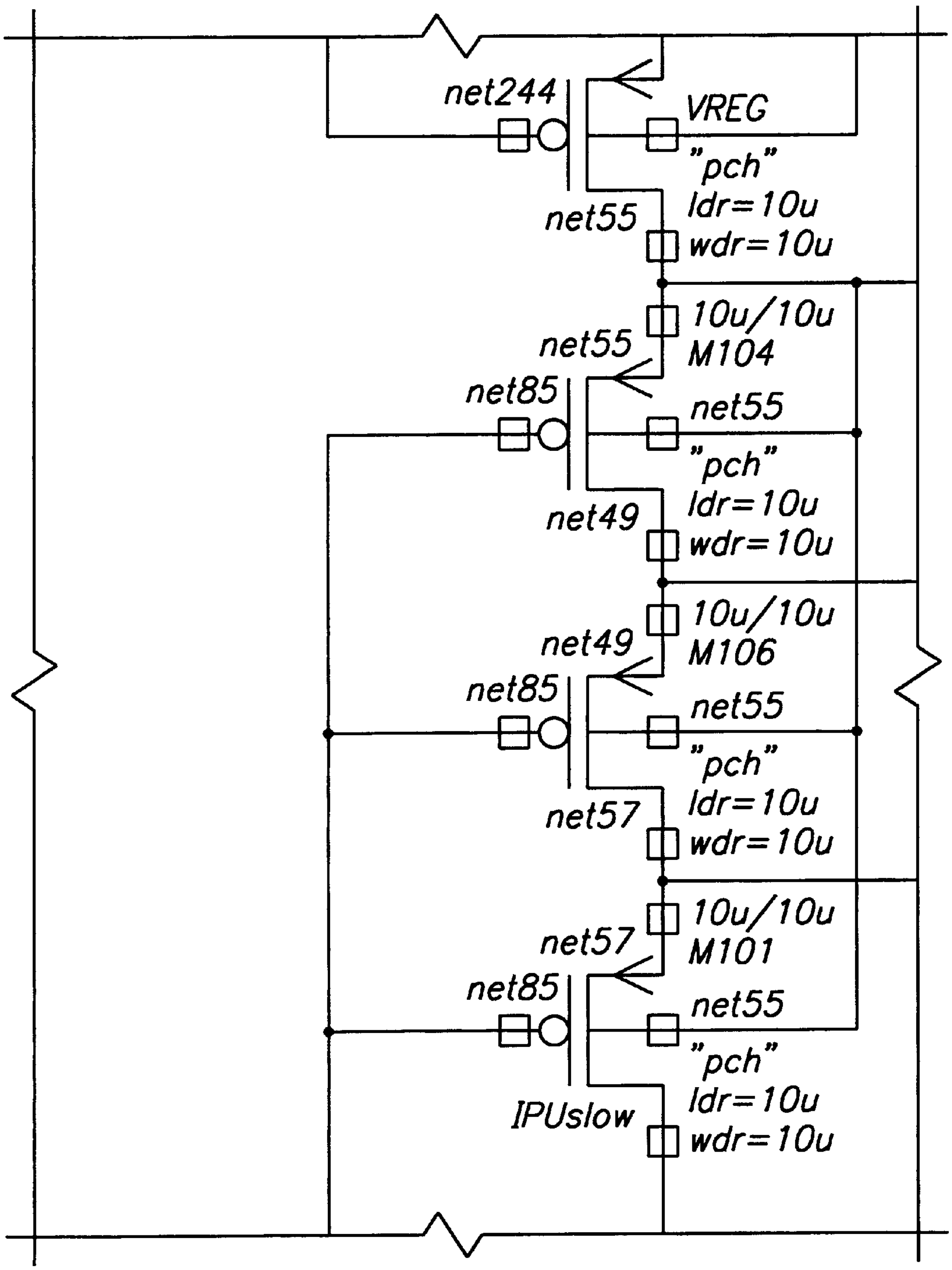
Fig 8.05040581

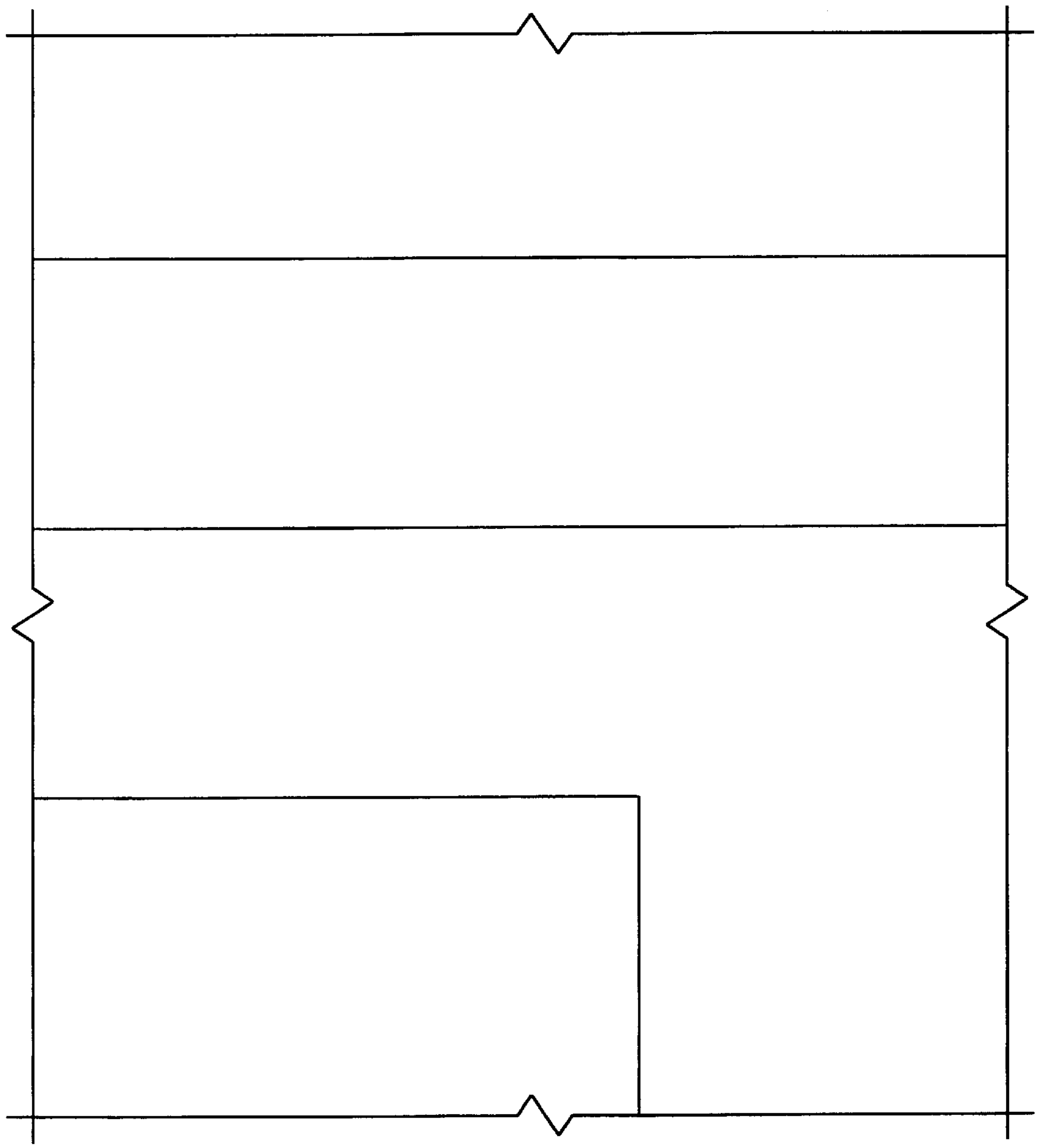
Fig 8.050405BK

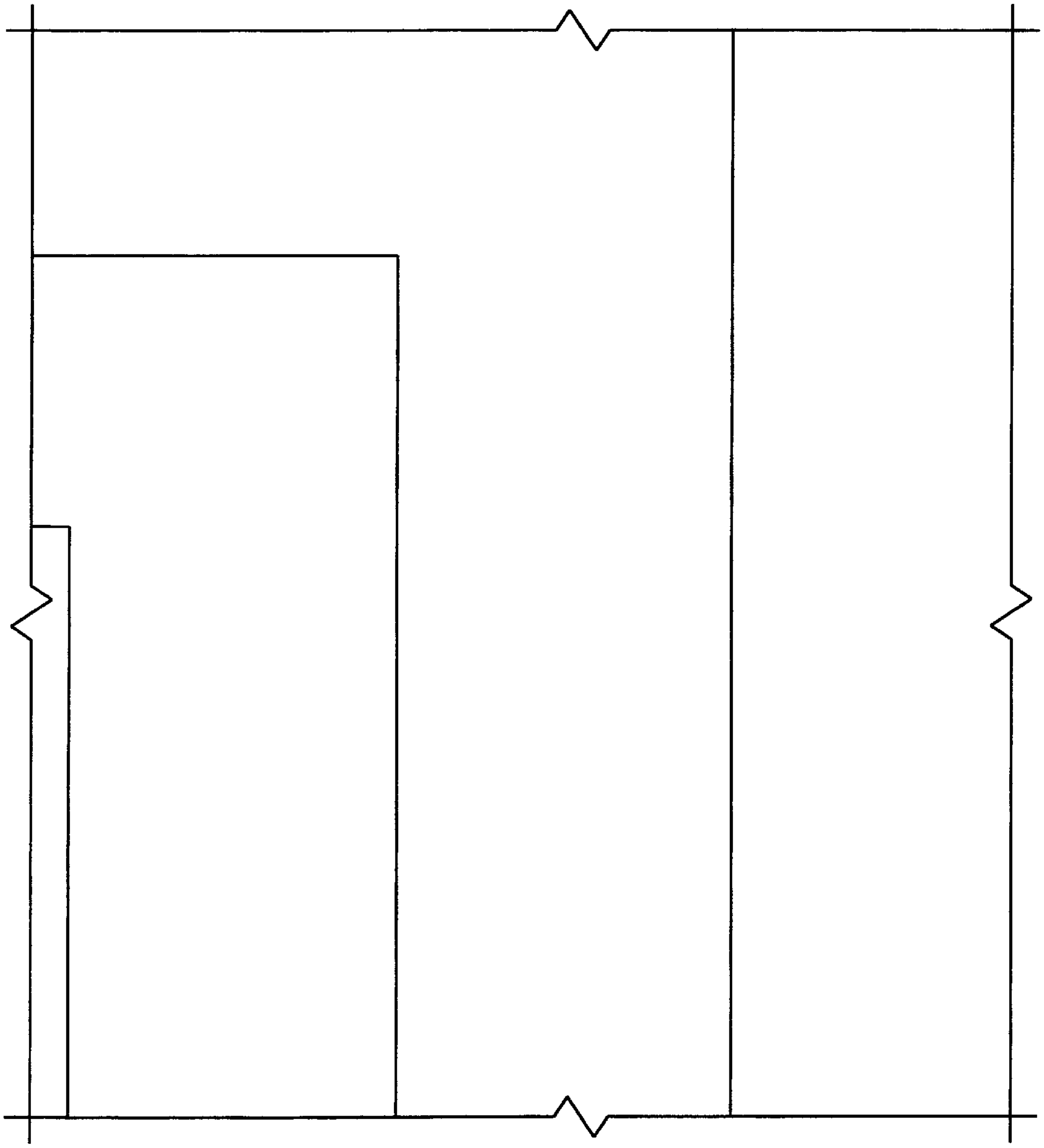
Fig 8.050405BL

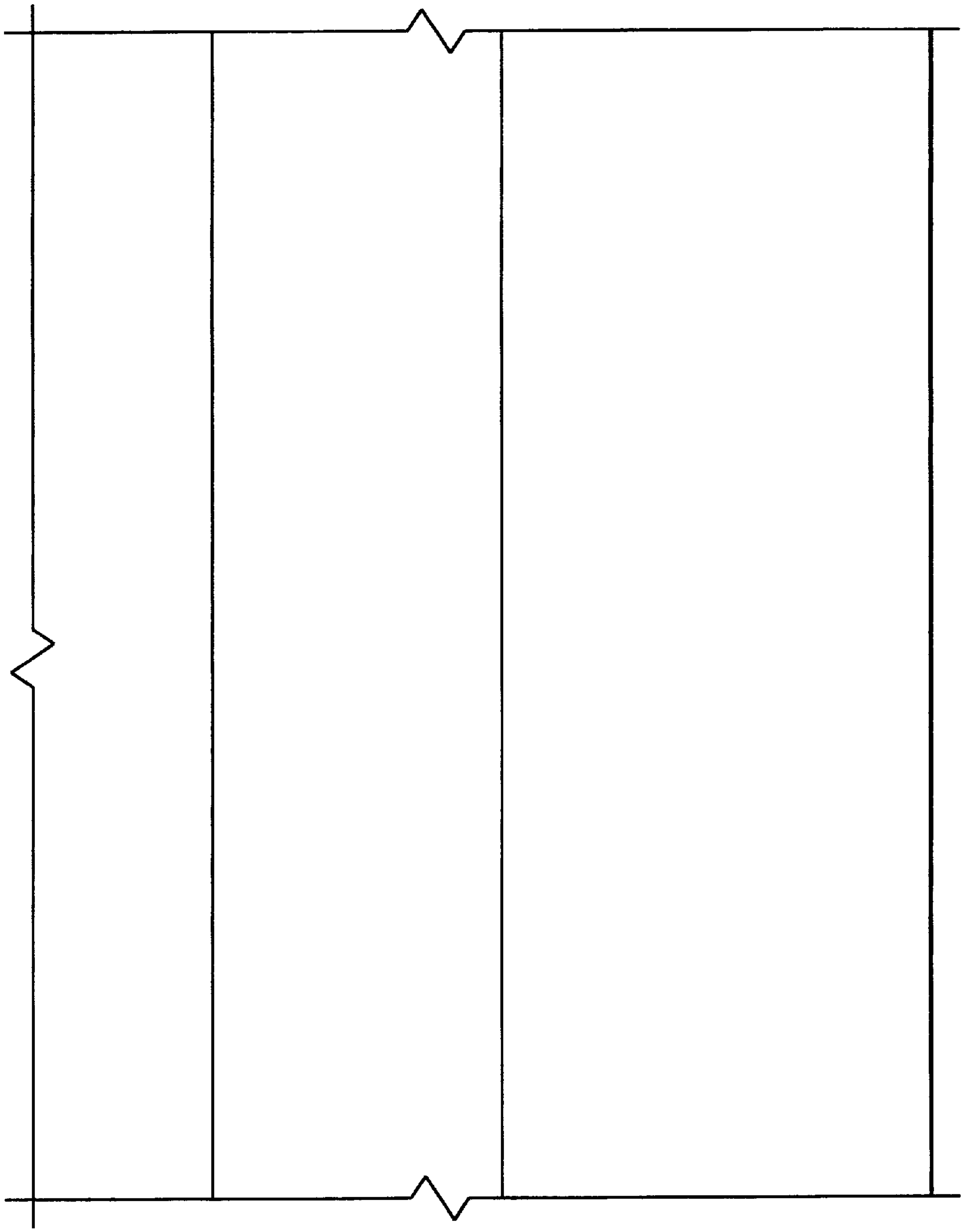
Fig 8.050405BM

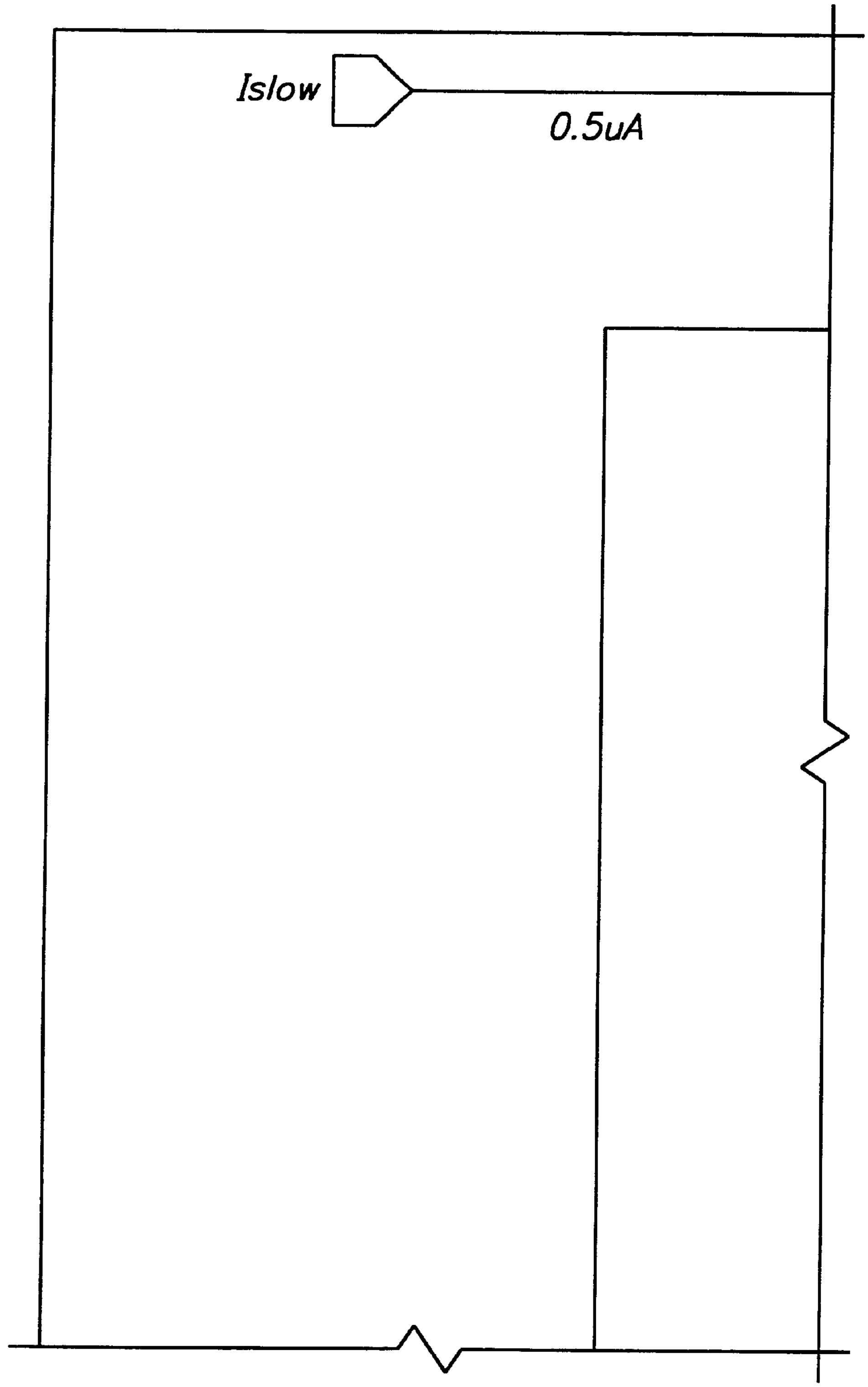
Fig 8.050405CA

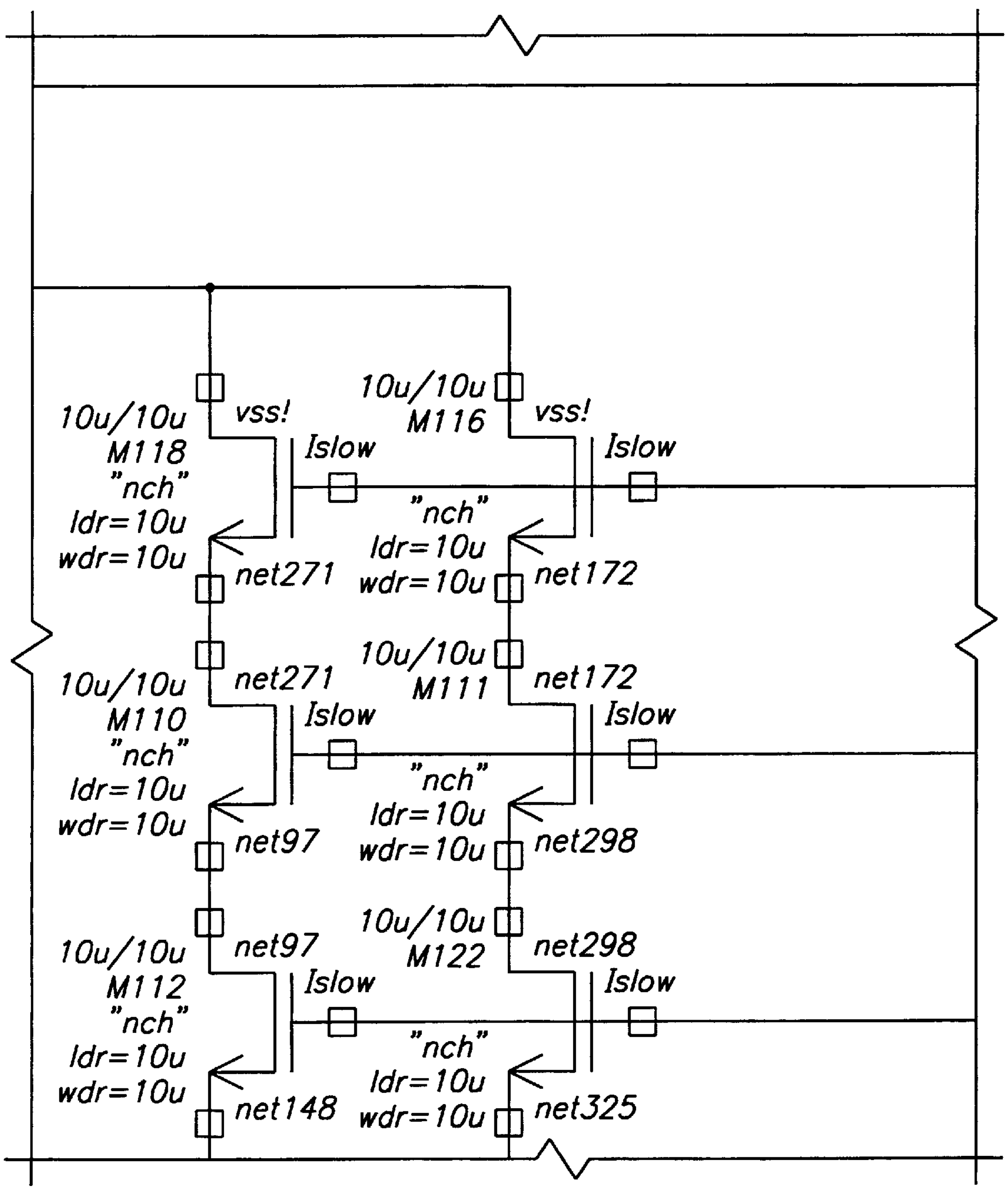
Fig 8.050405CB

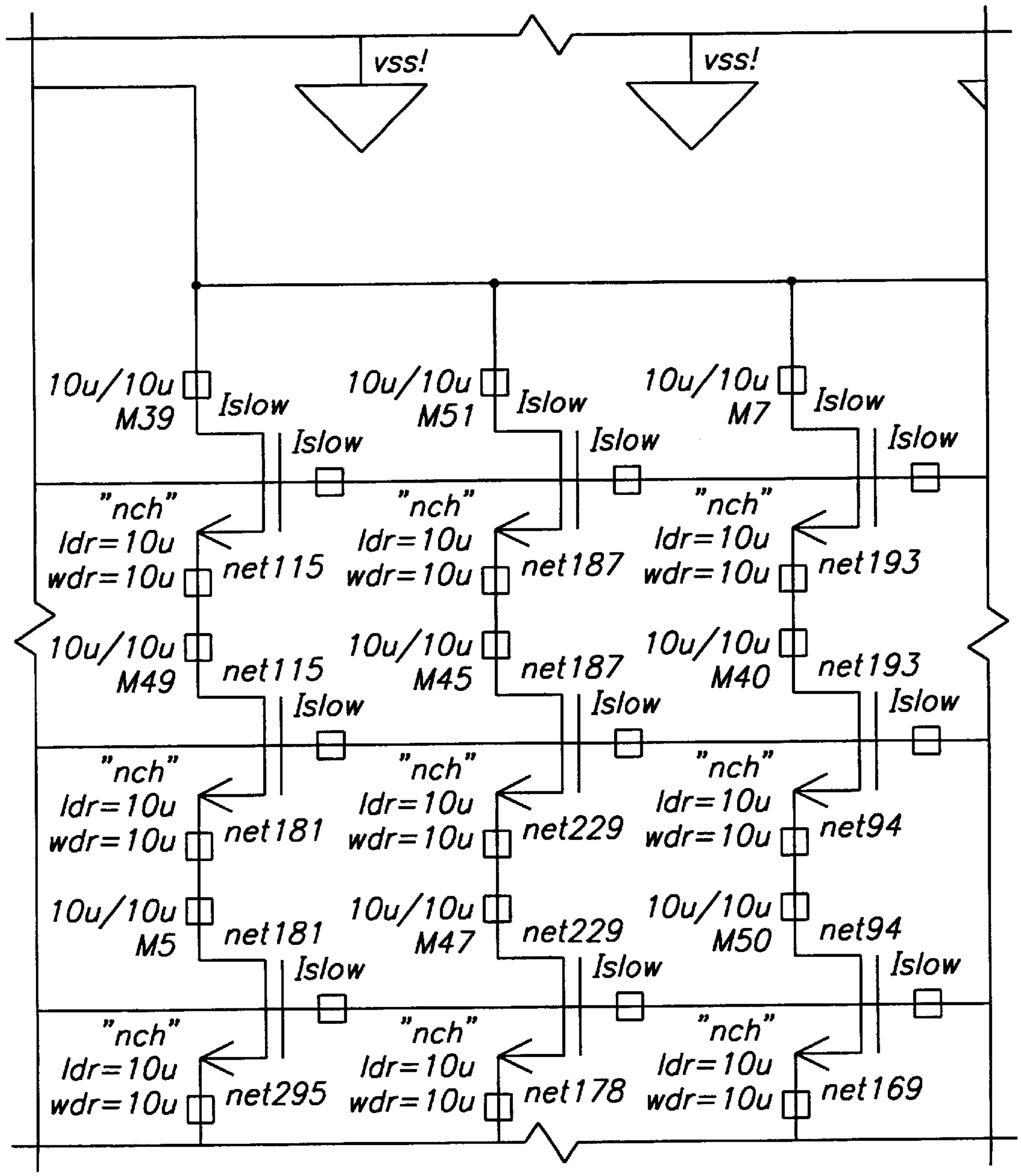
Fig. 8.050405CC

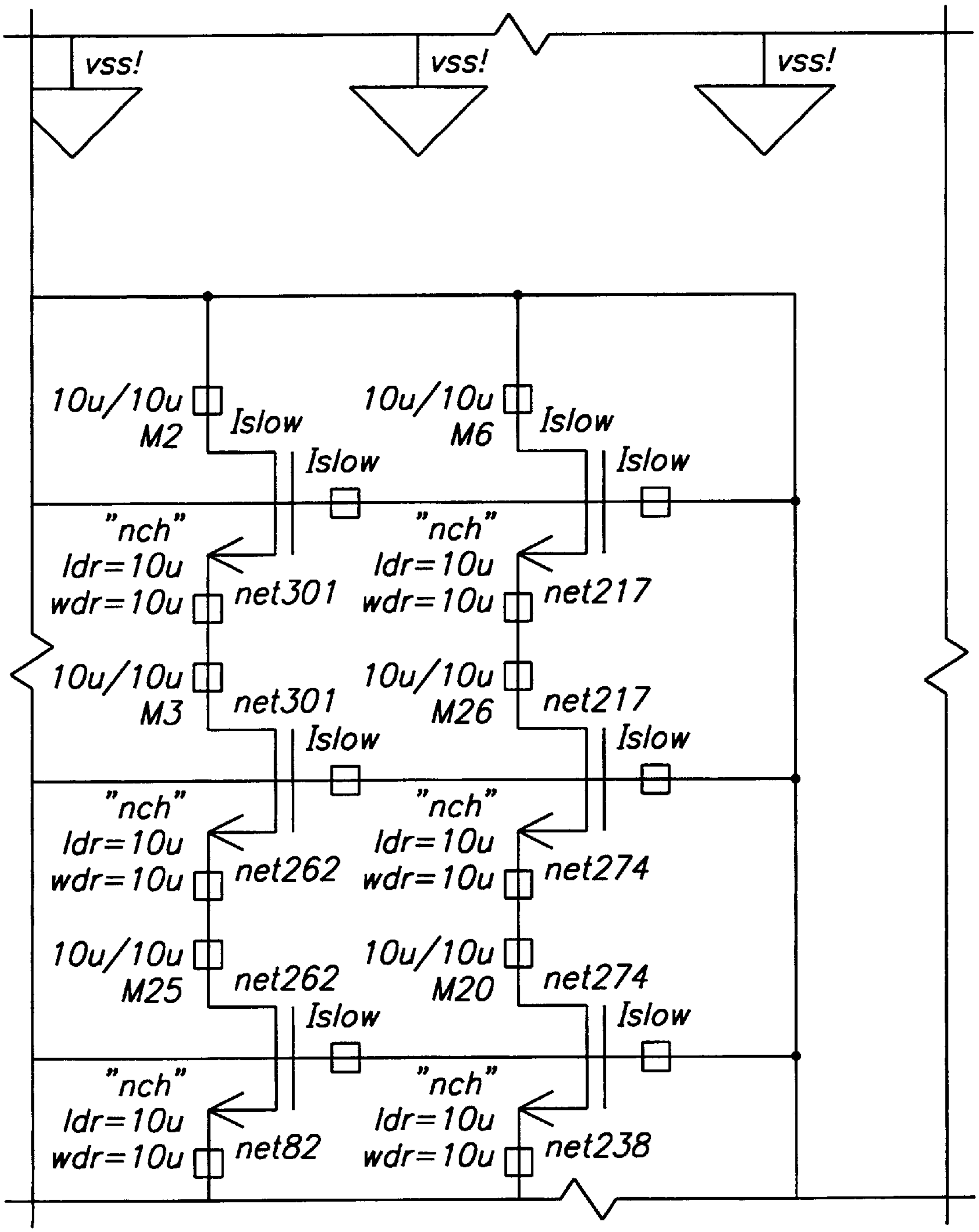
Fig. 8.050405CD

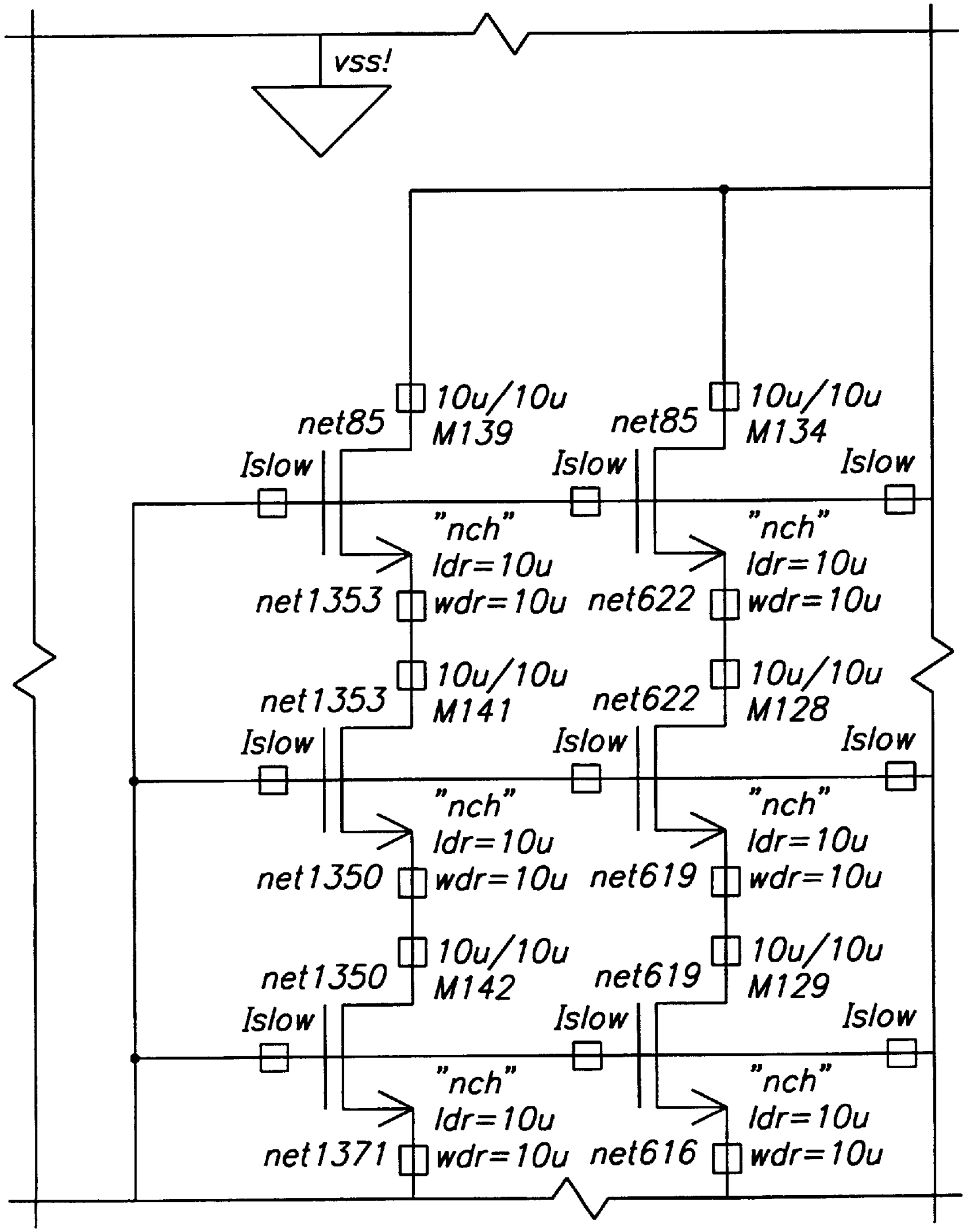
Fig 8.050405CE

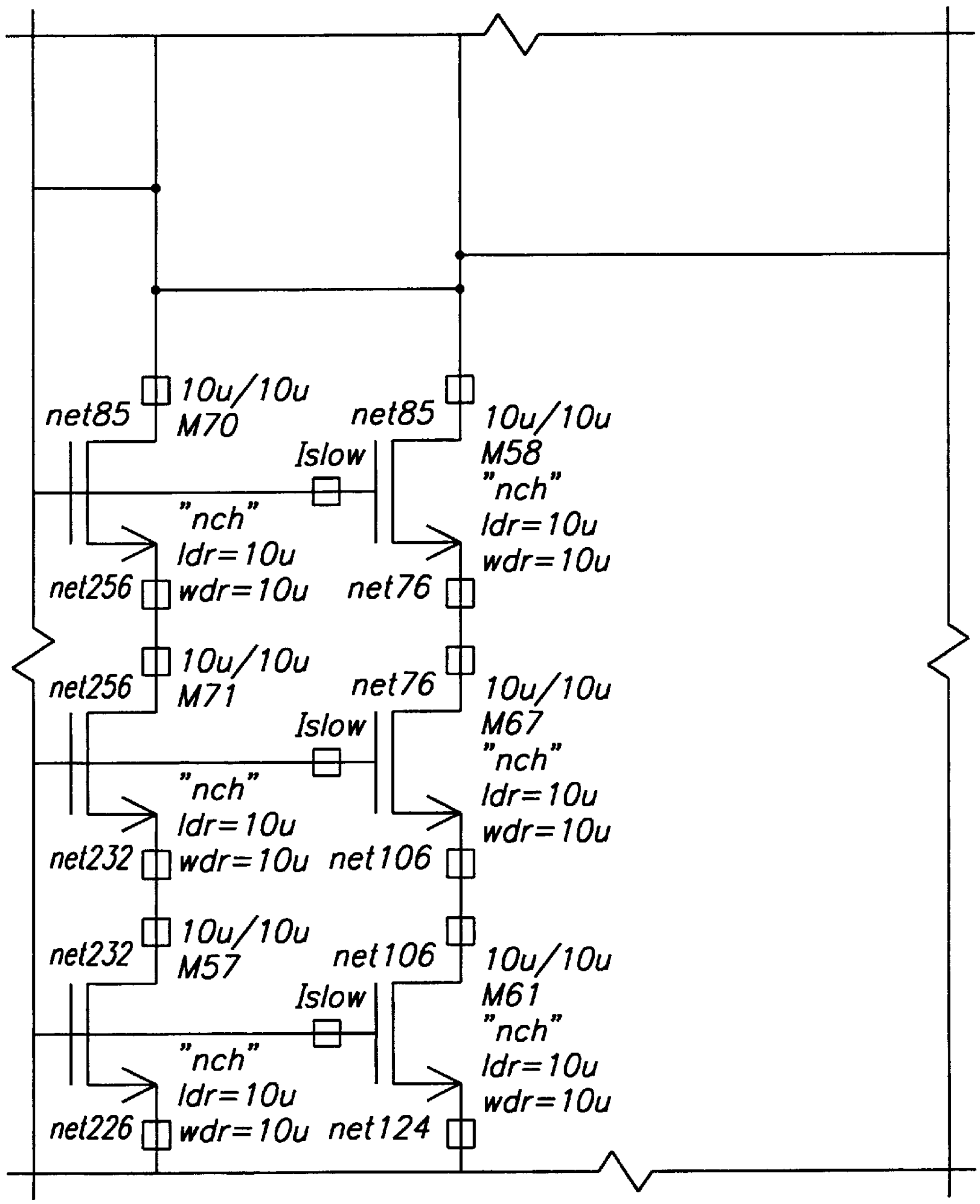
Fig 8.050405CF

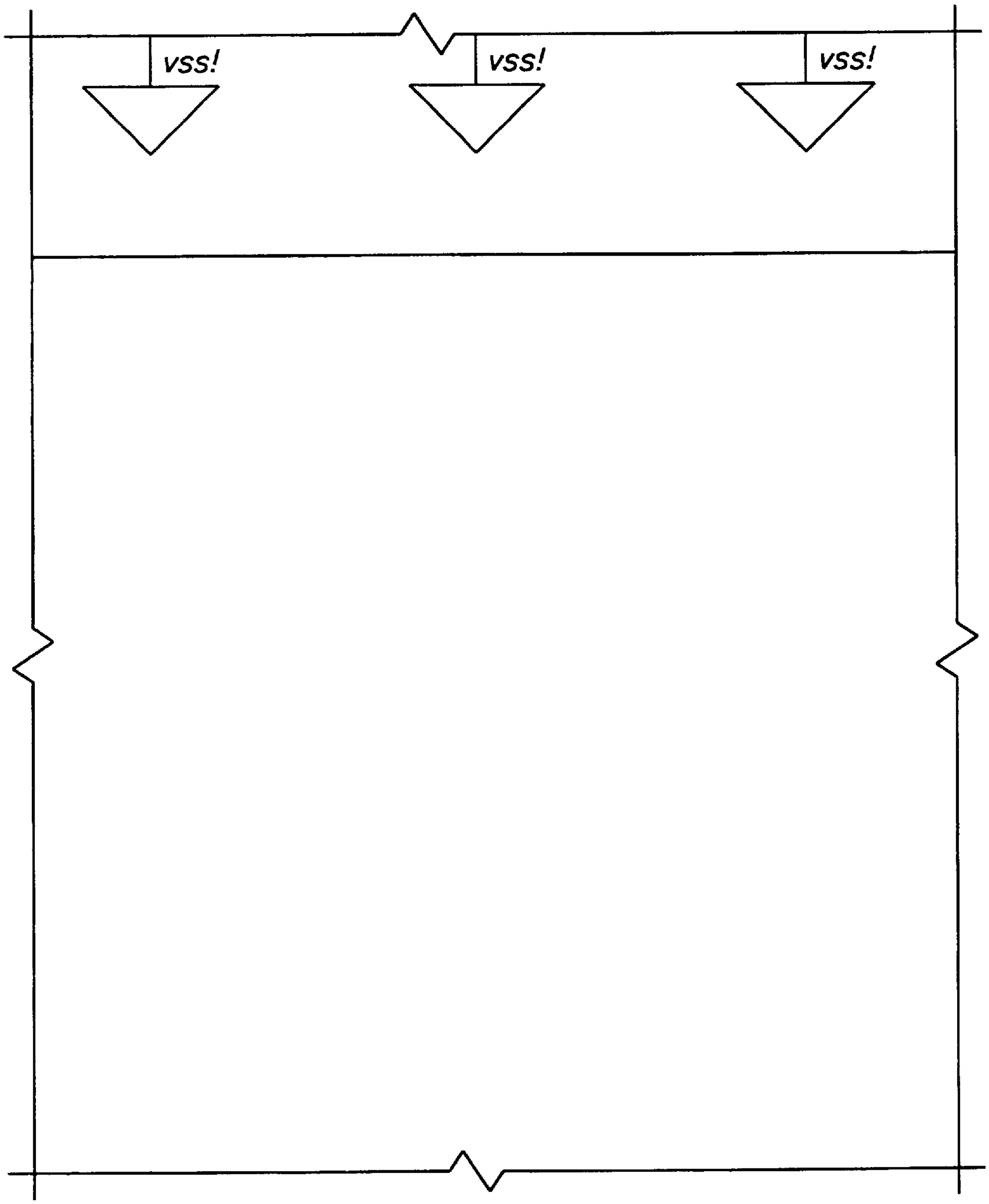
Fig 8.05040SCG

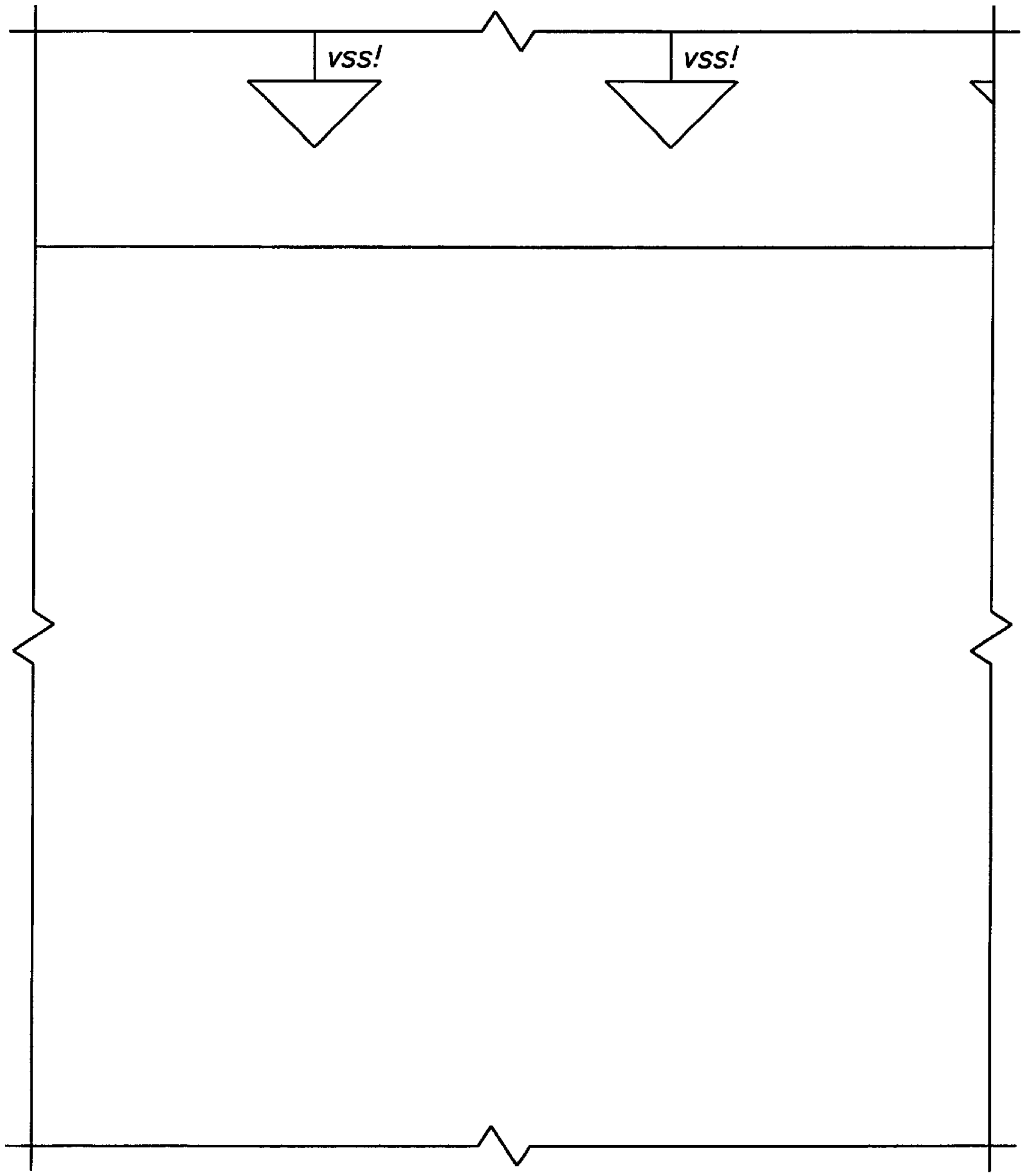
FIG 8.050405CH

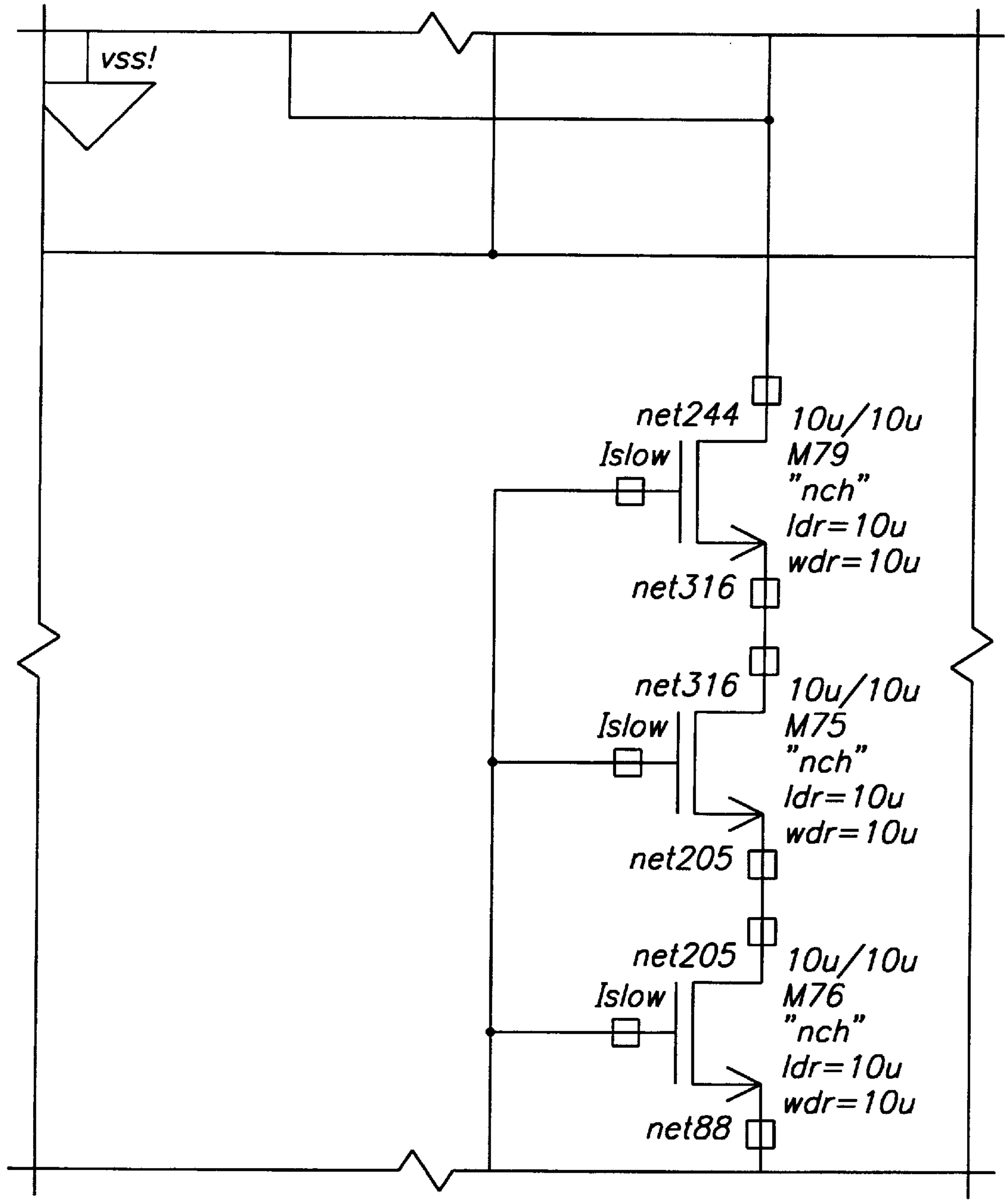
Fig 8.050405CI

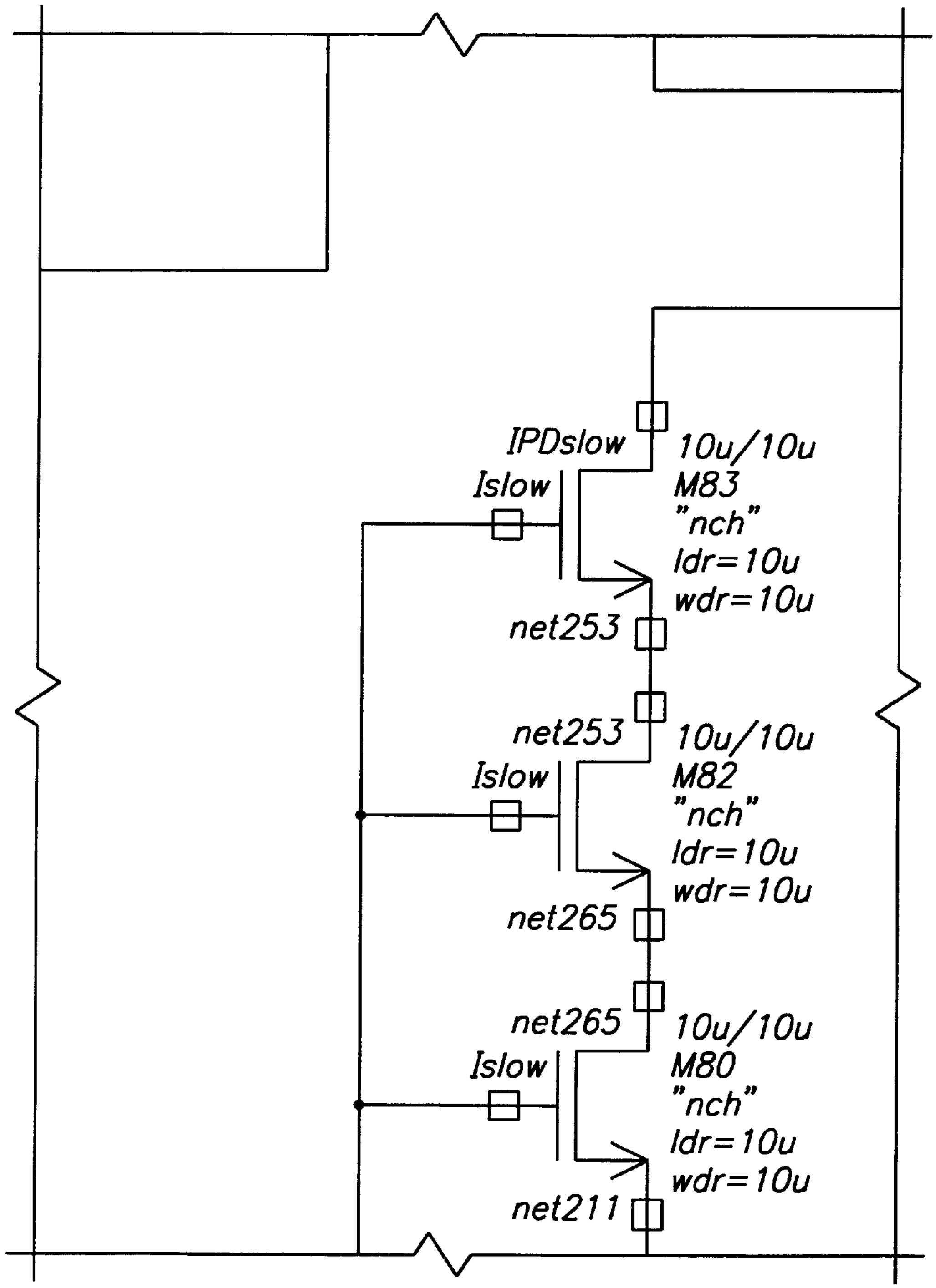
Fig 8.050405C.J

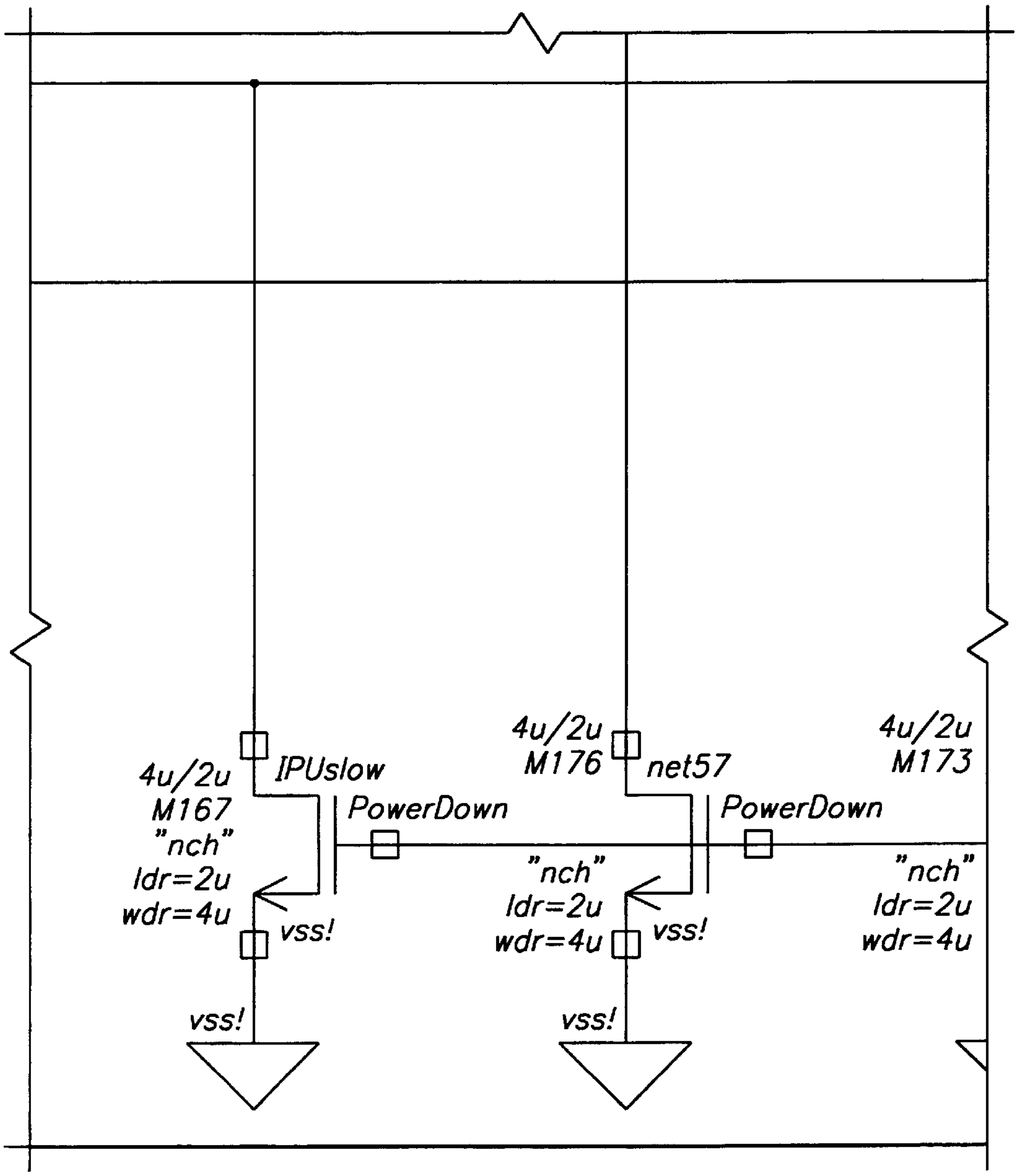
Fig 8.05040SCK

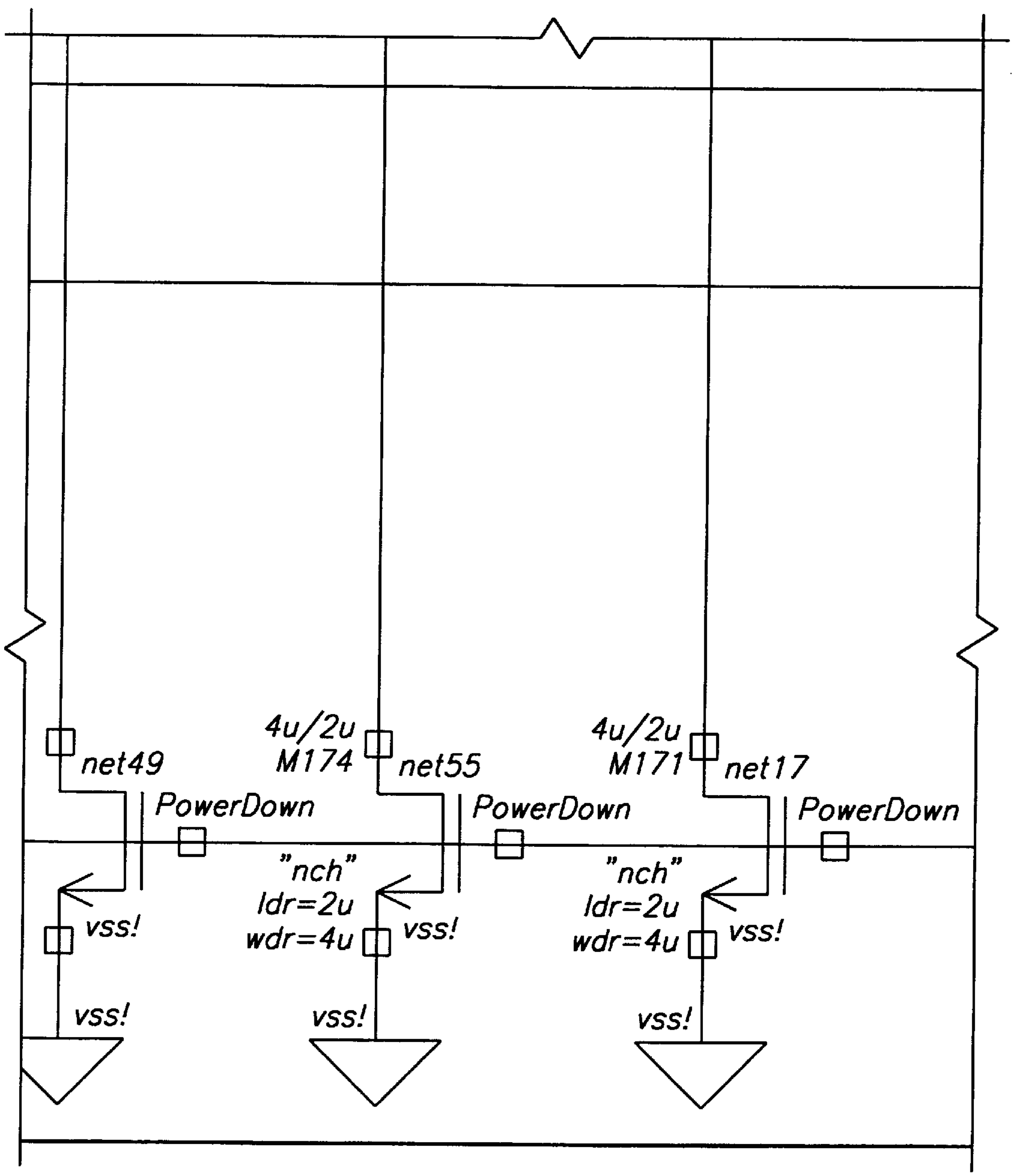
Fig. 8.050405CL

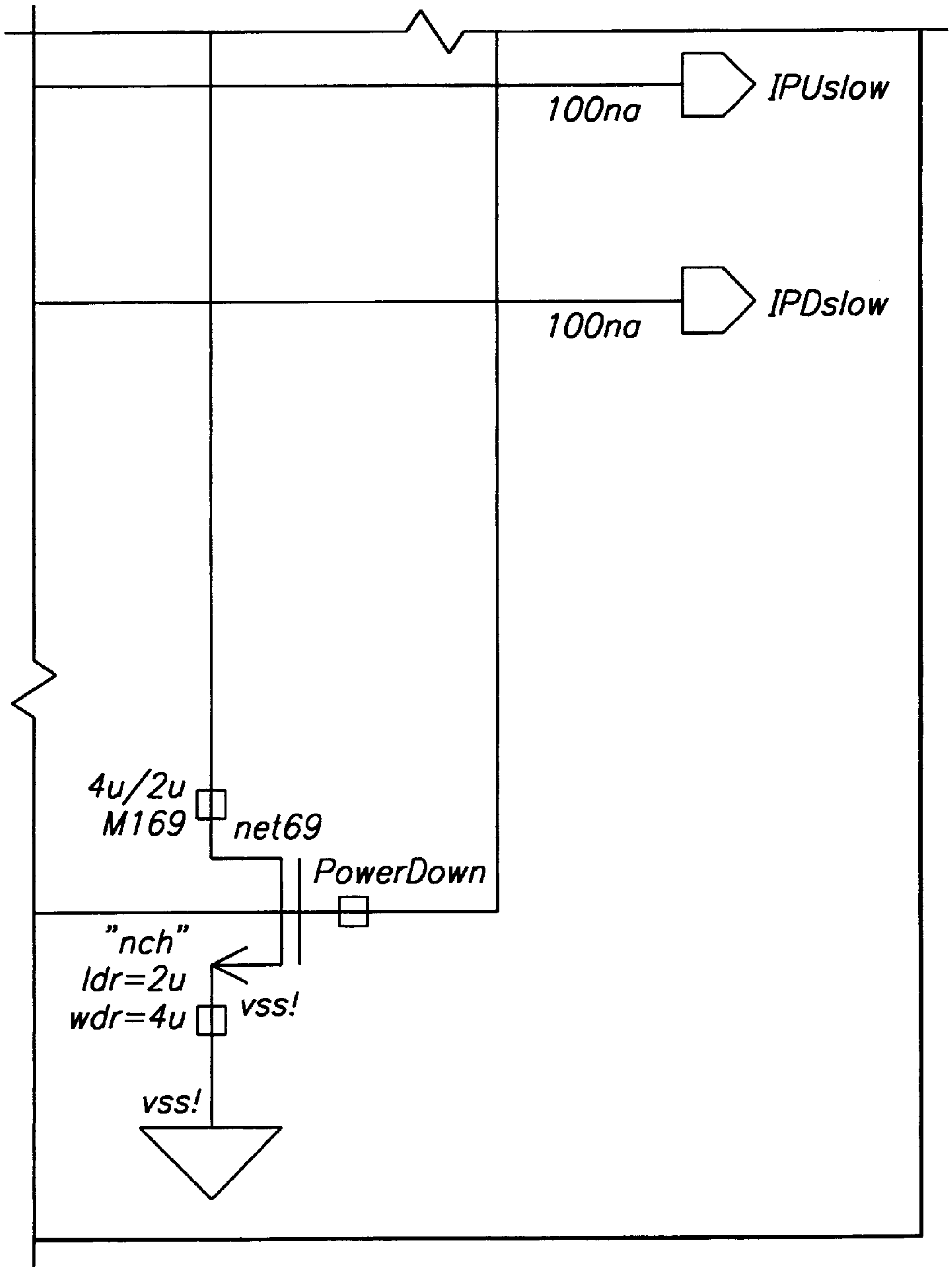
Fig 8.050405CM

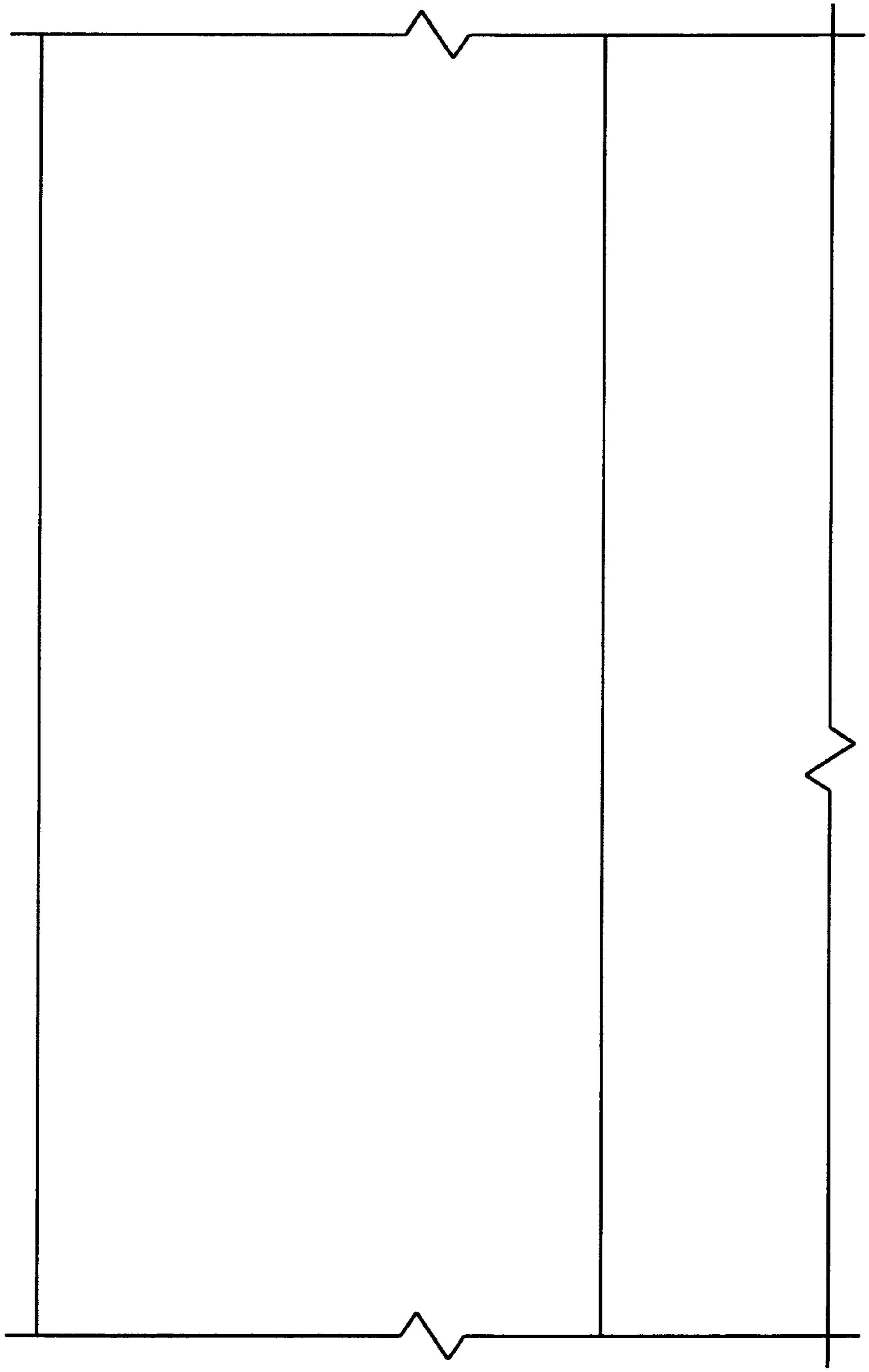
FIG 8.05040SDA

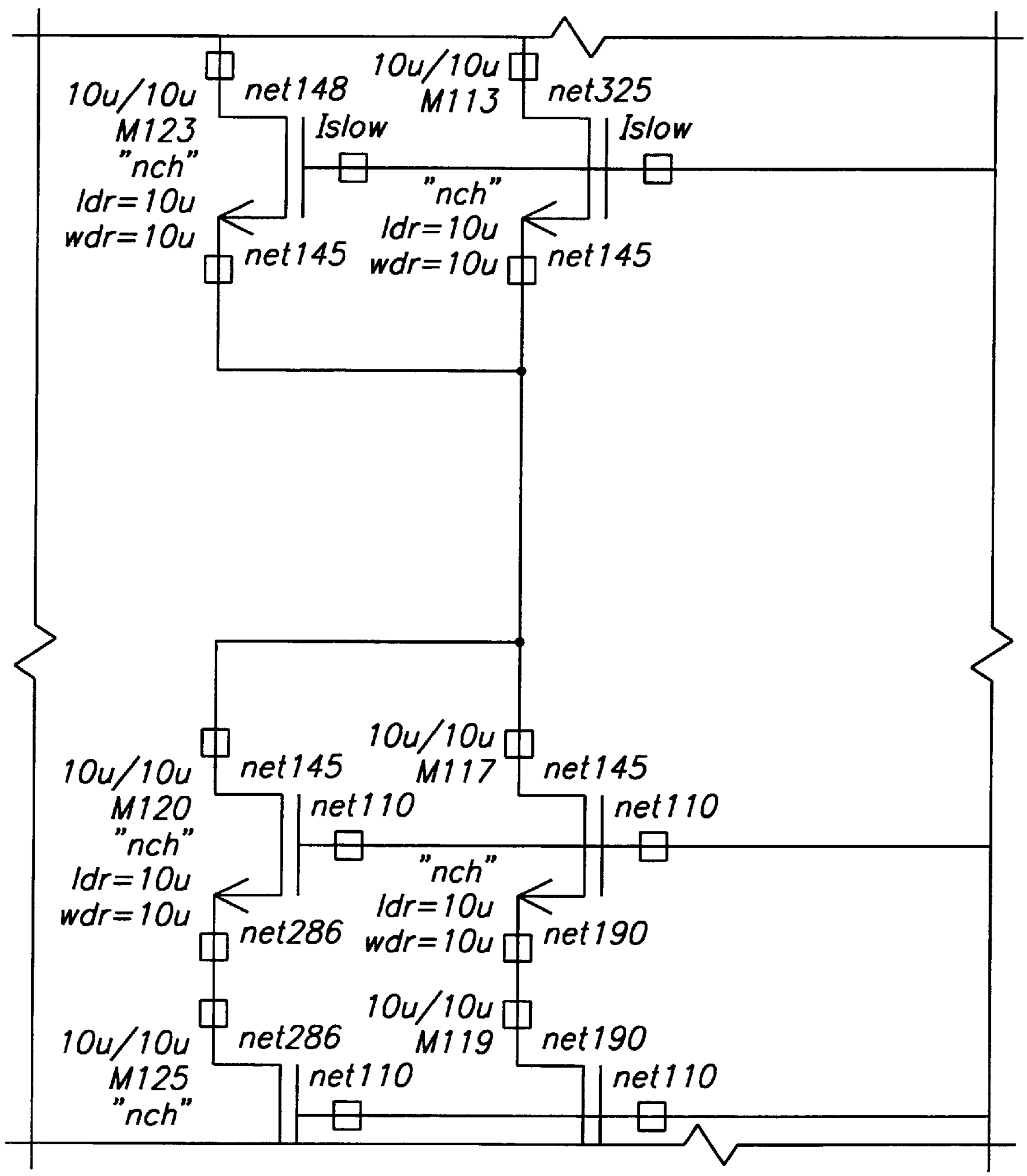
Fig 8.050405DB

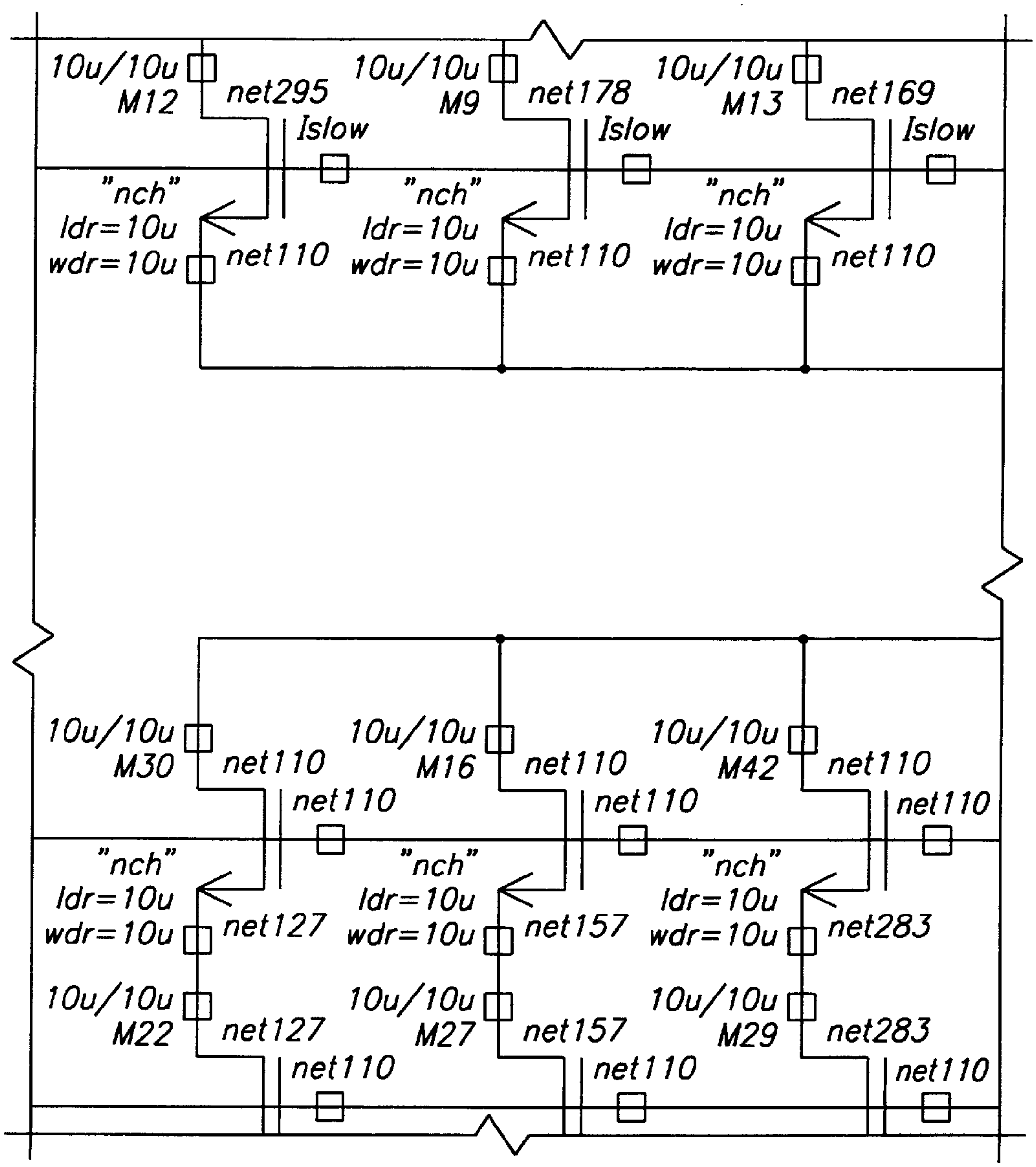
Fig 8.05040SDC

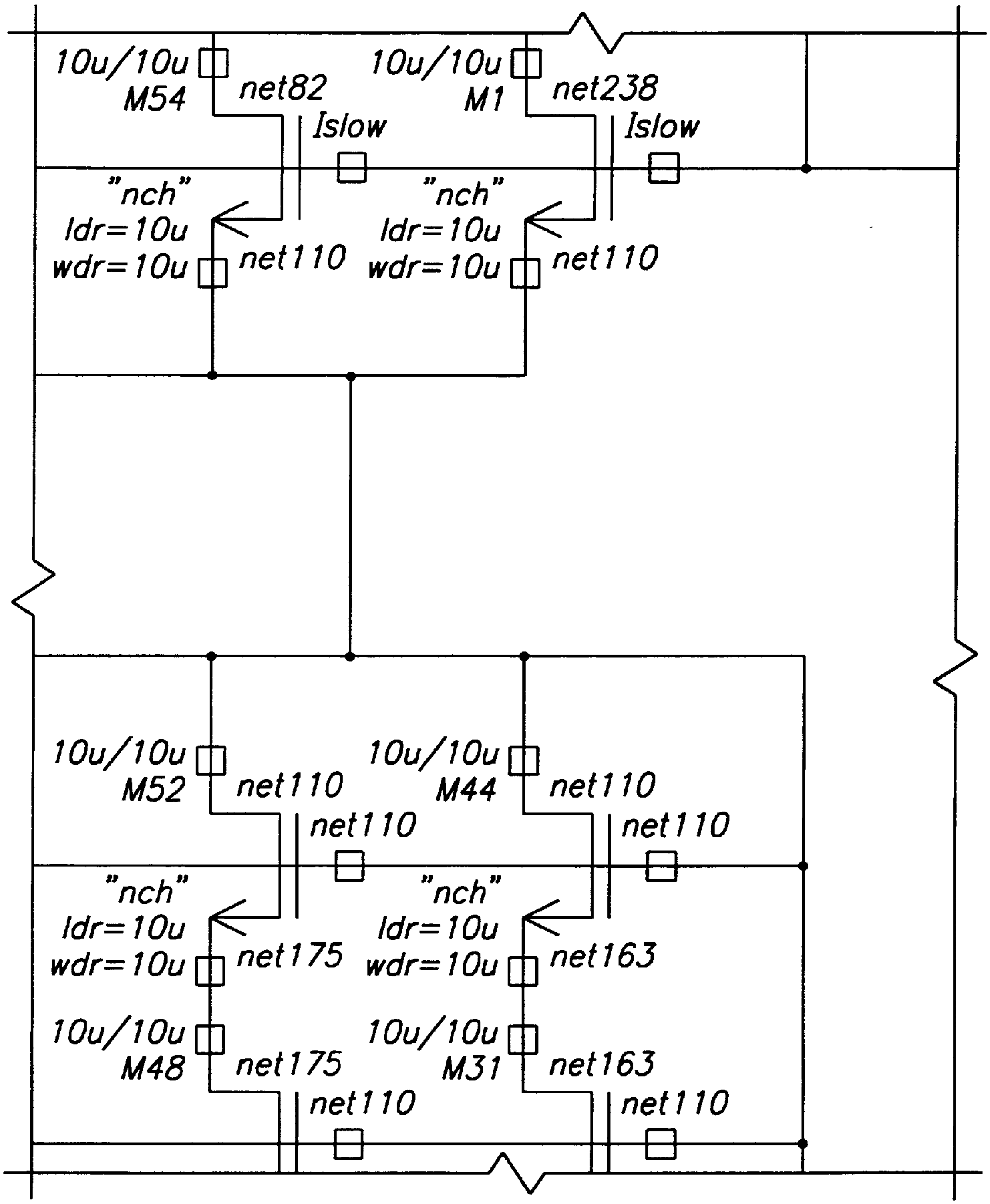
Fig 8.050405DD

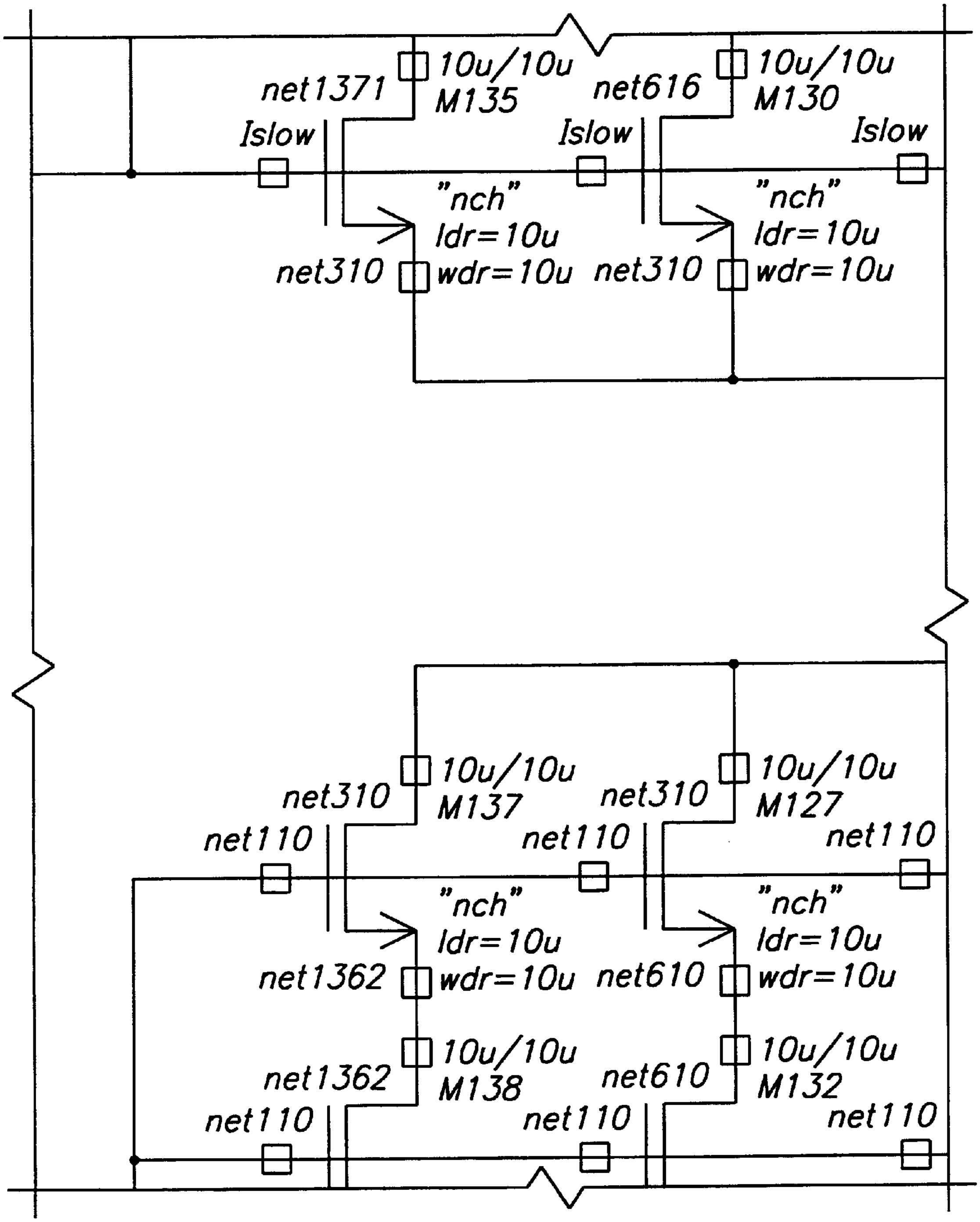
FIG 8.050405DE

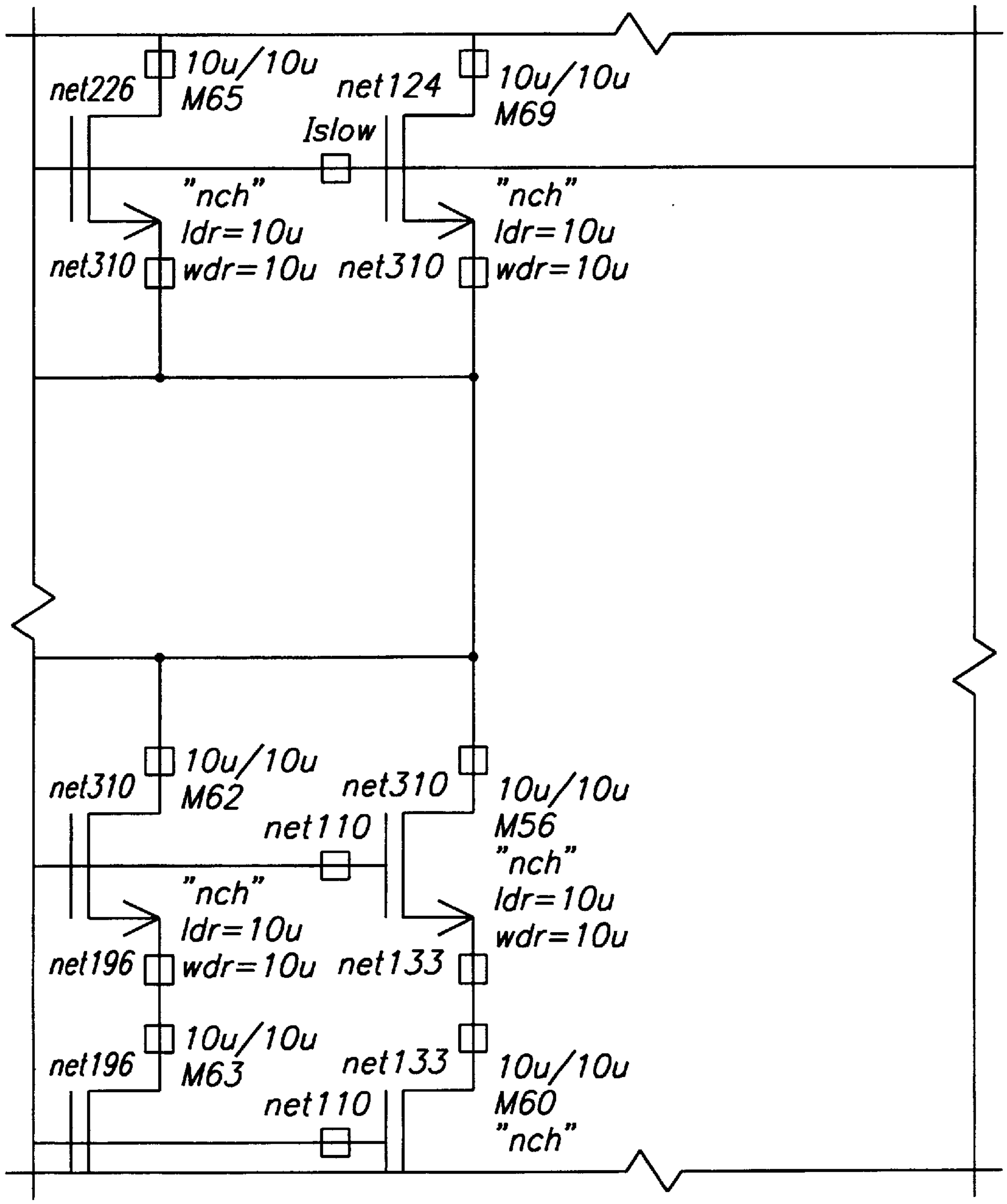
Fig 8.0504.05DF

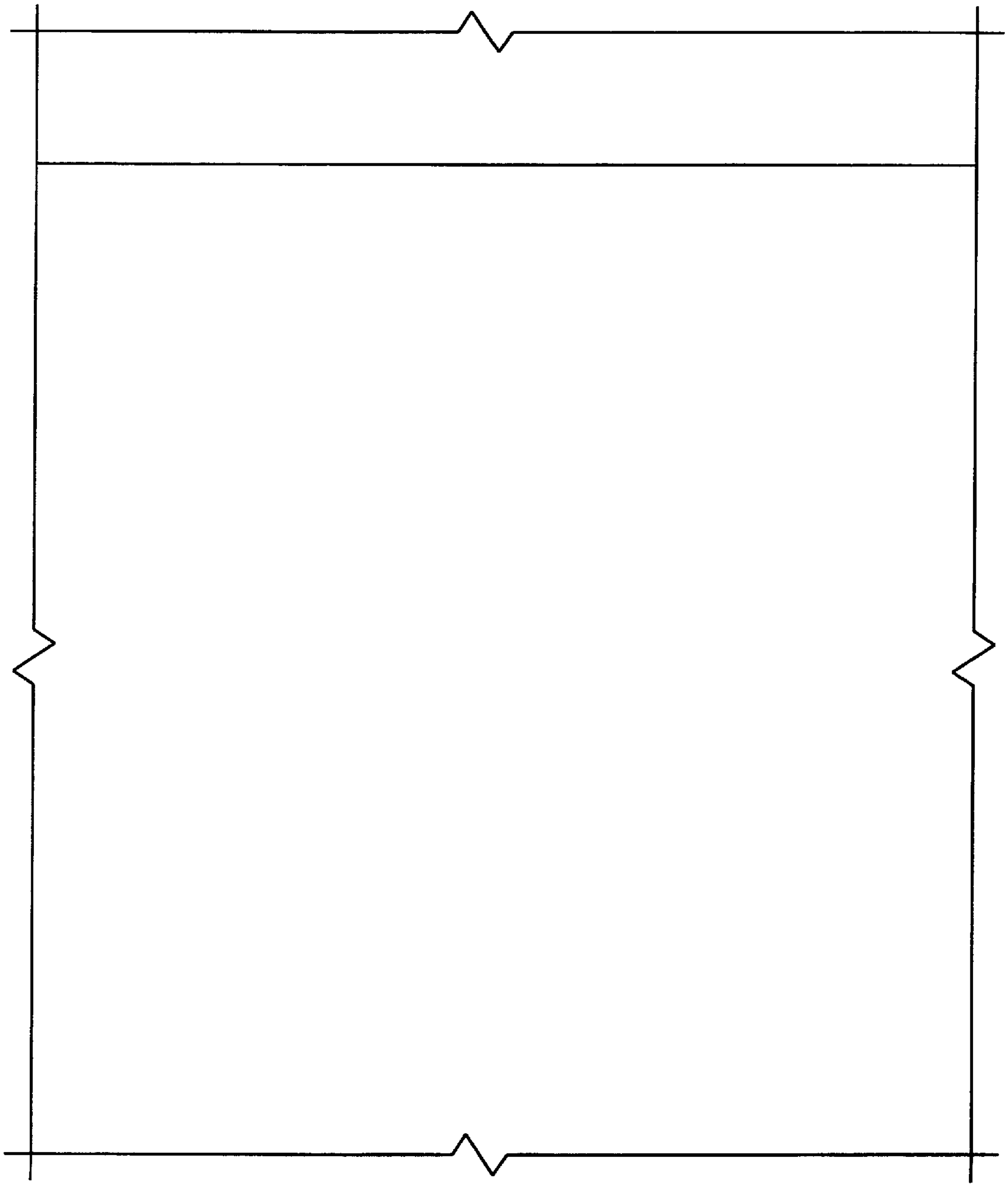
FIG 8.05040506

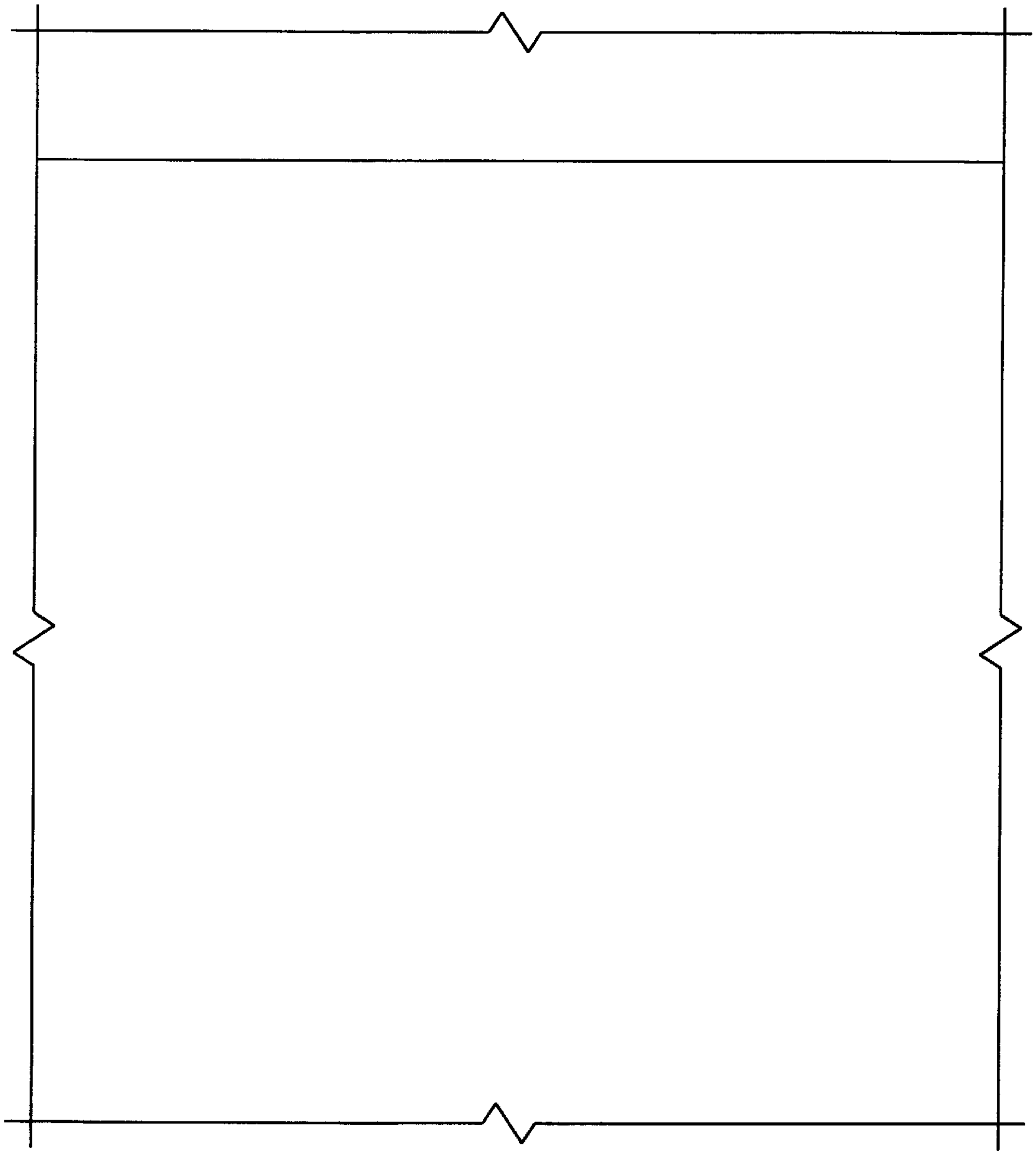
Fig 8.050405DH

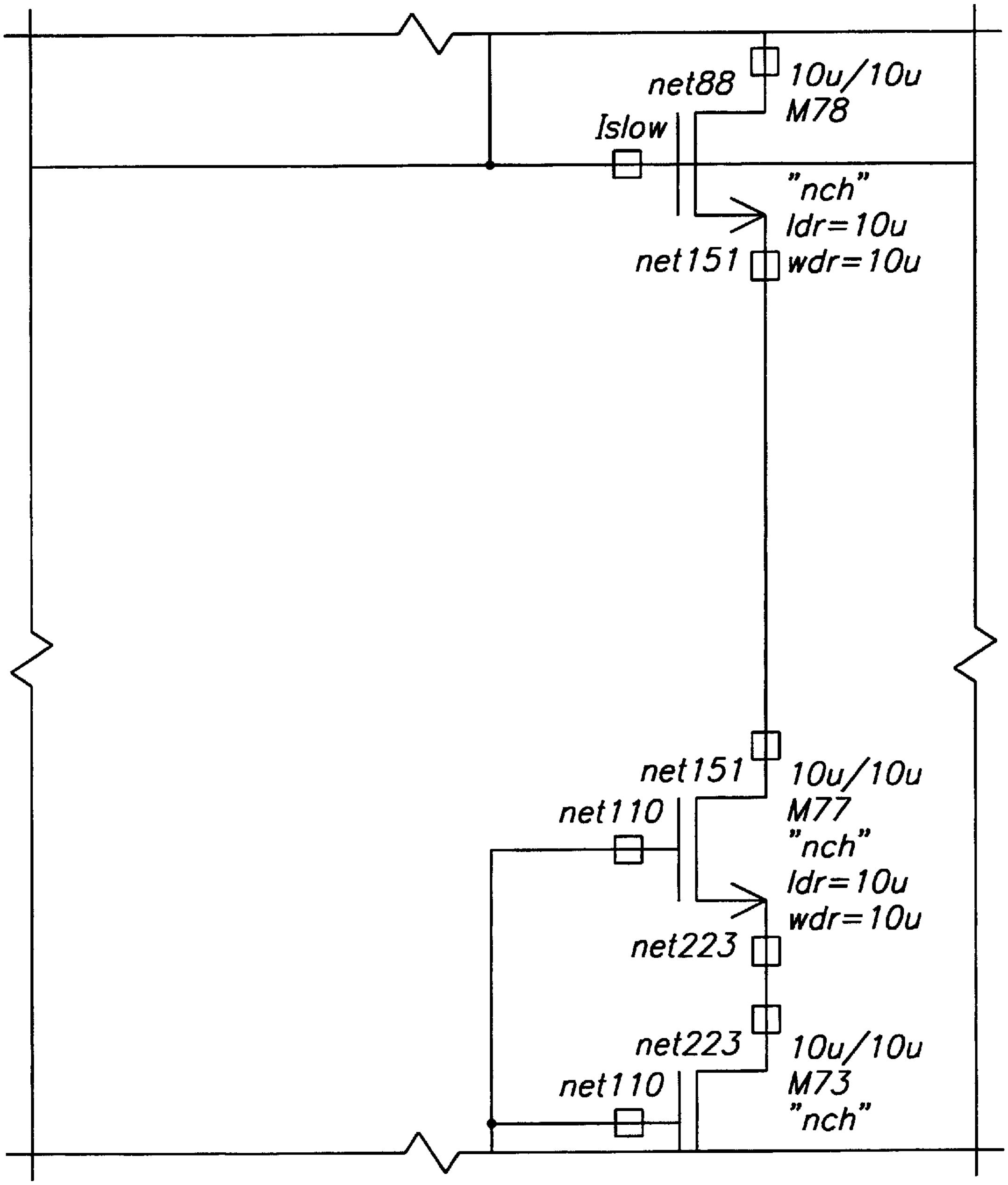
Fig 8.05040SDI

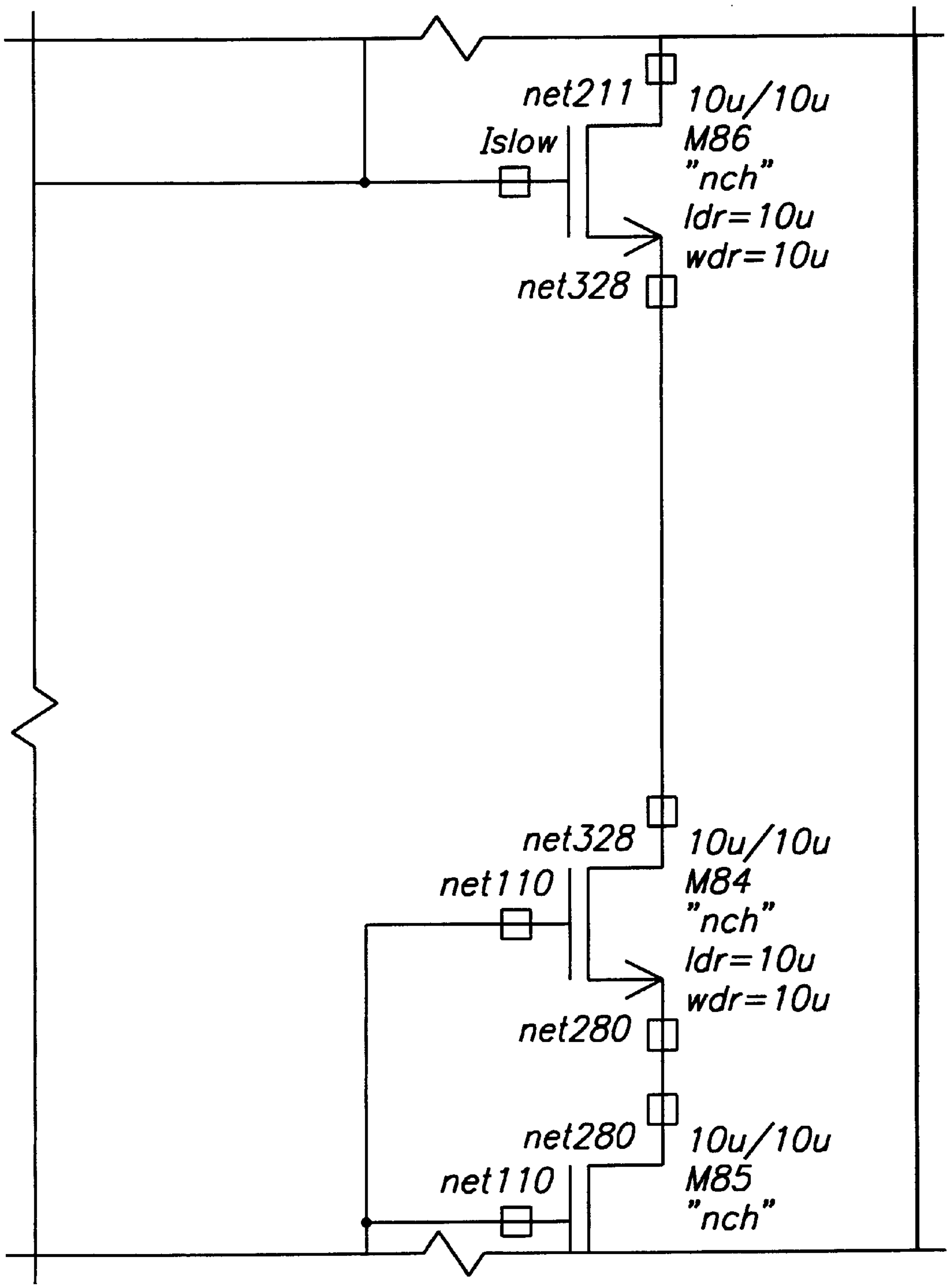
Fig 8.050405D.J

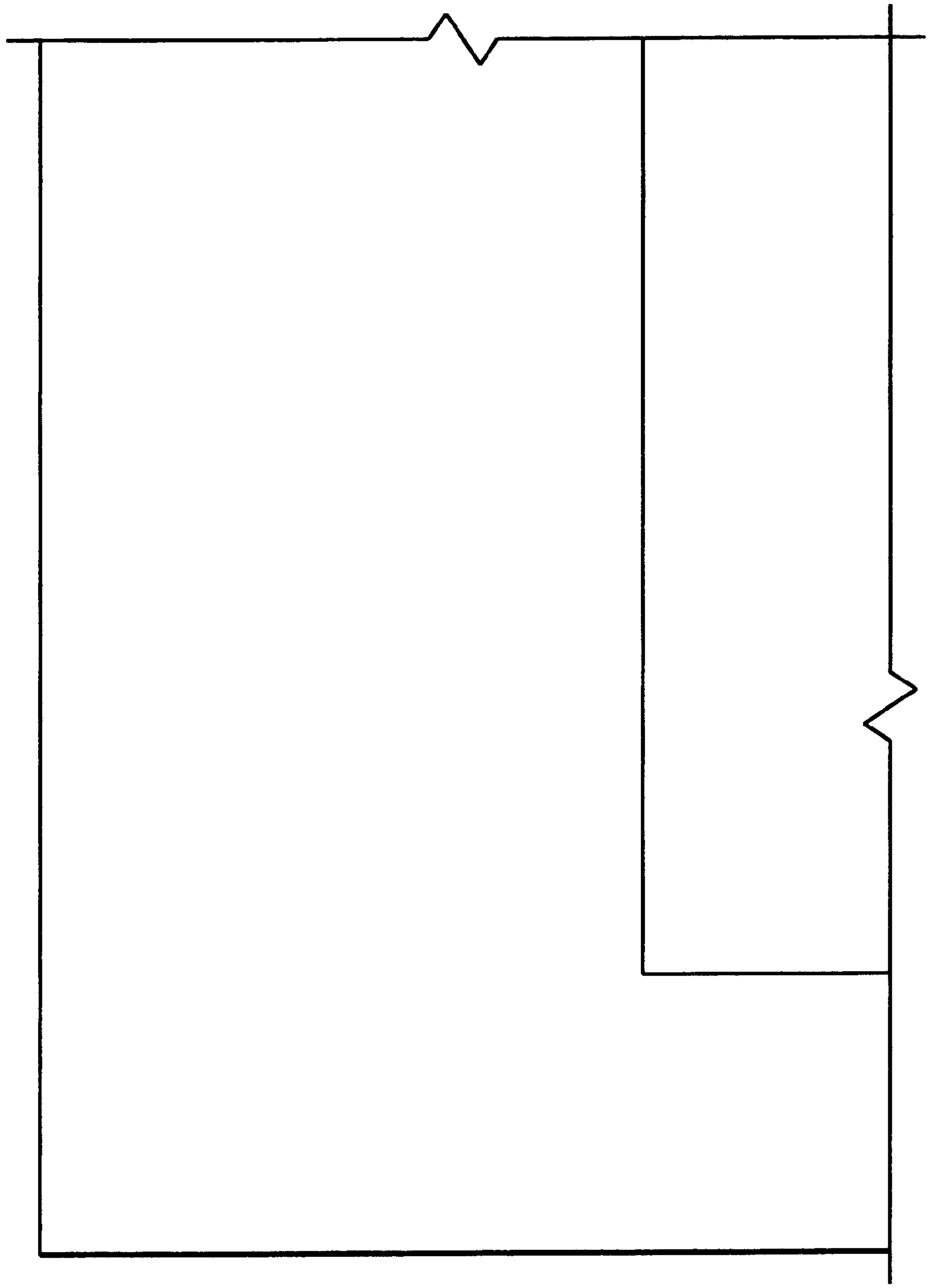
Fig 8.0504.05EA

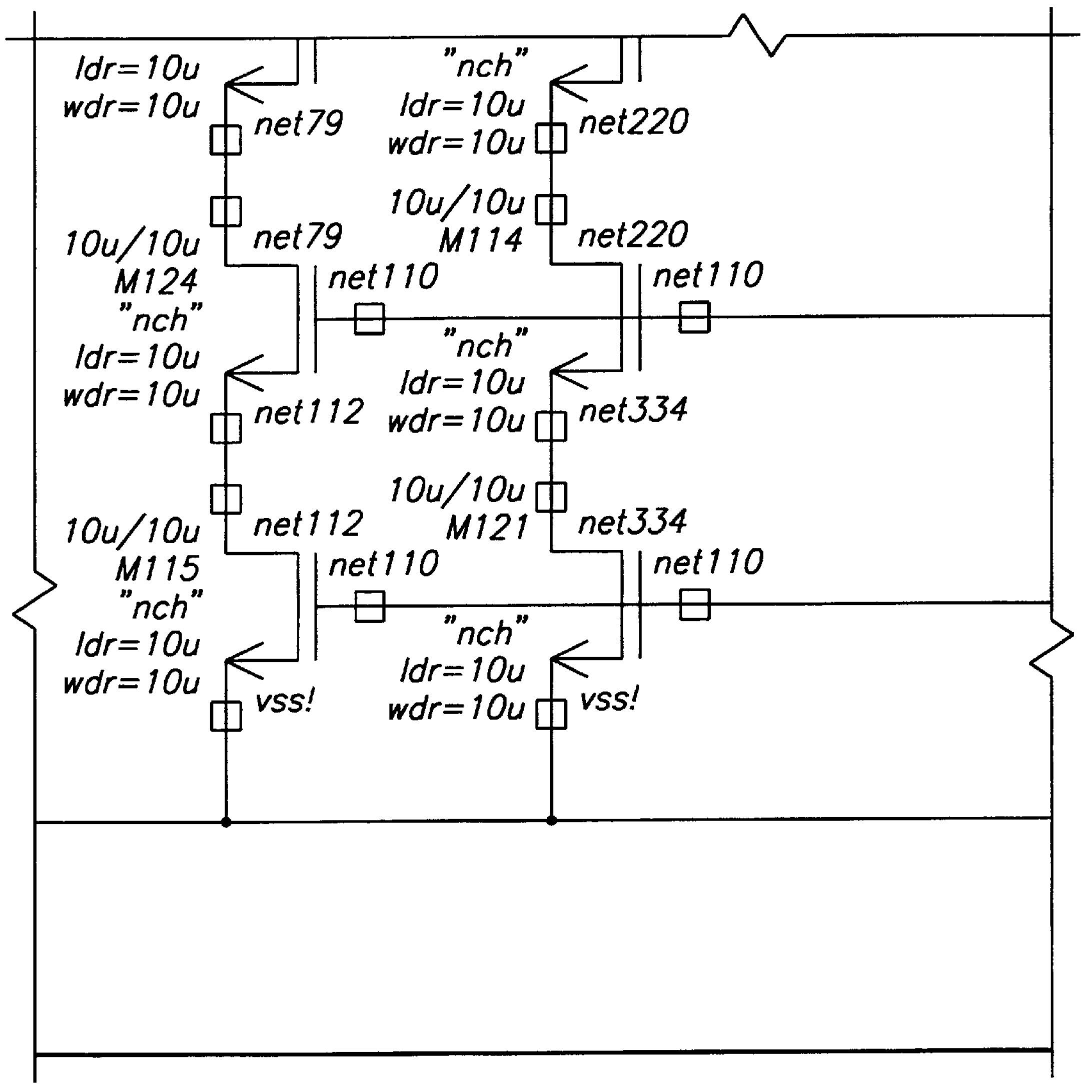
Fig 8.050405EB

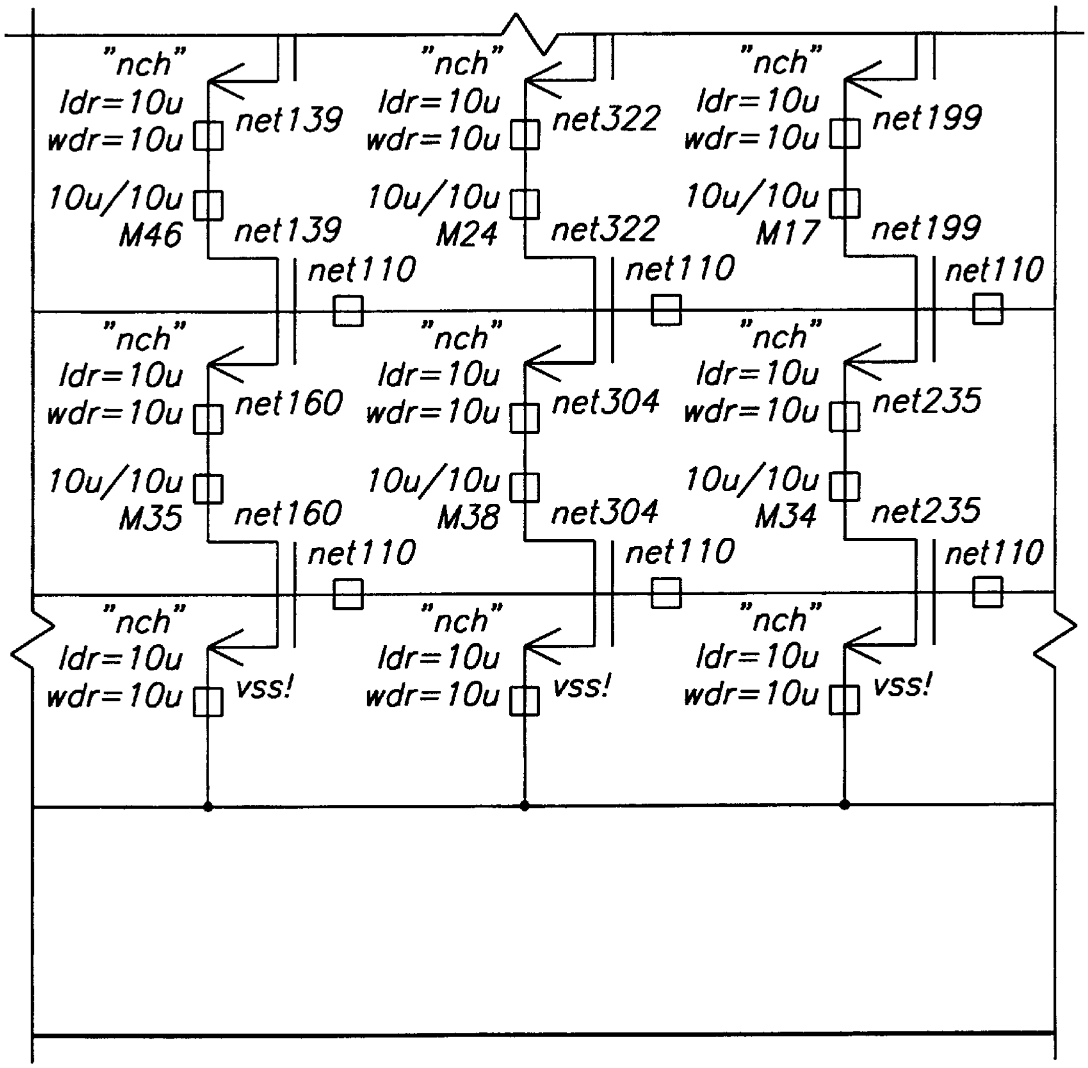
Fig 8.050405EC

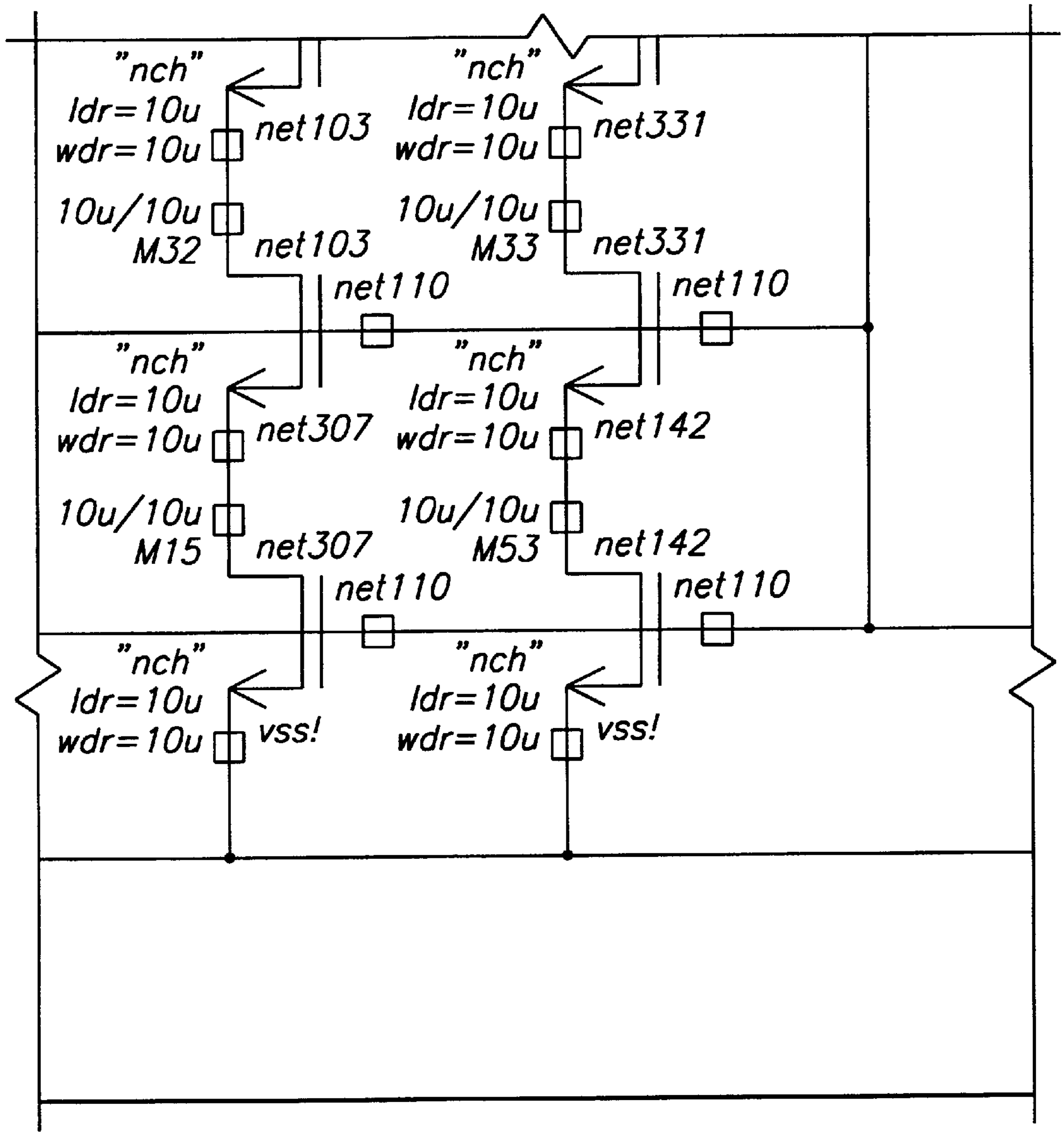
Fig 8.050405ED

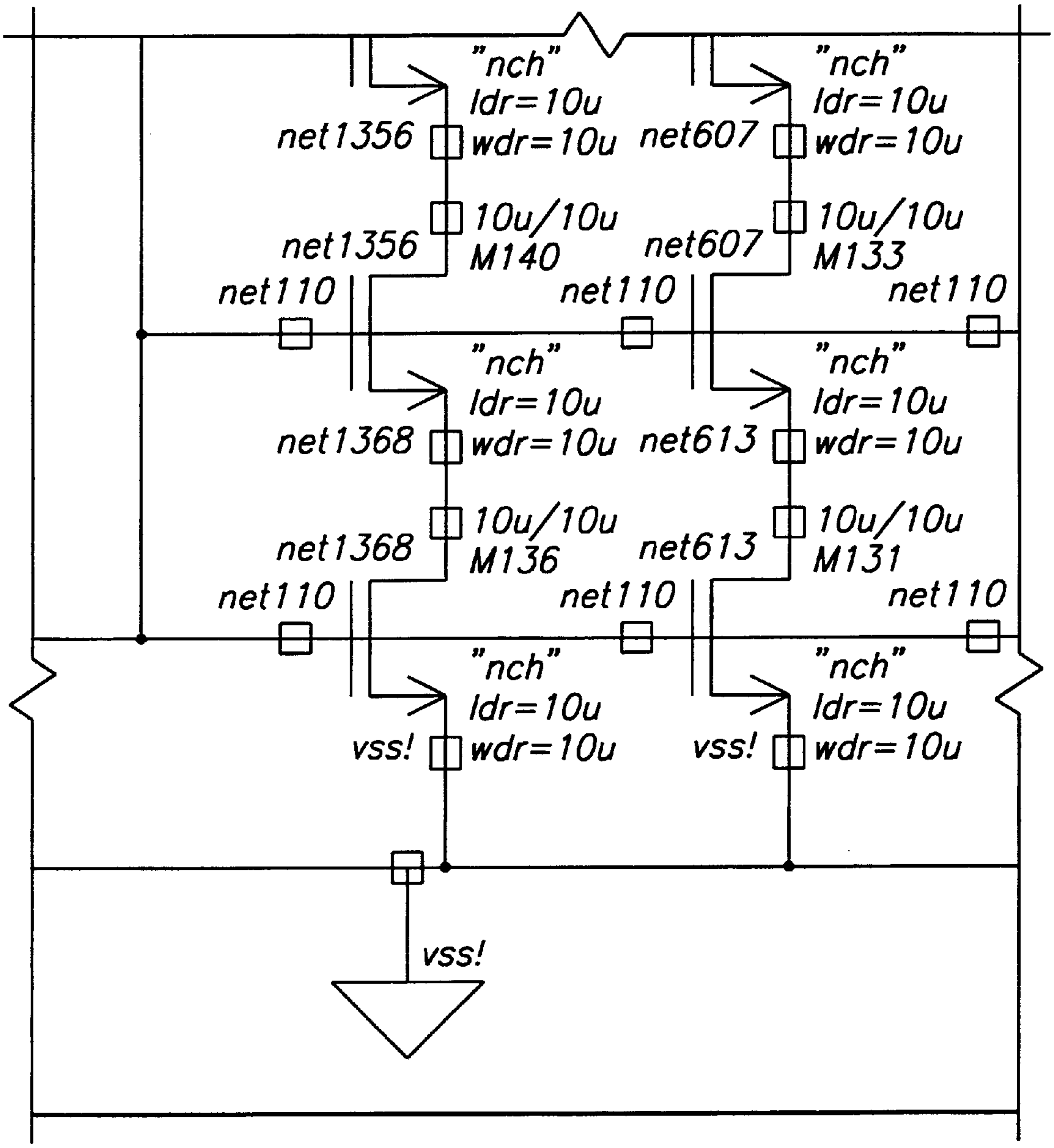
Fig 8.050405EE

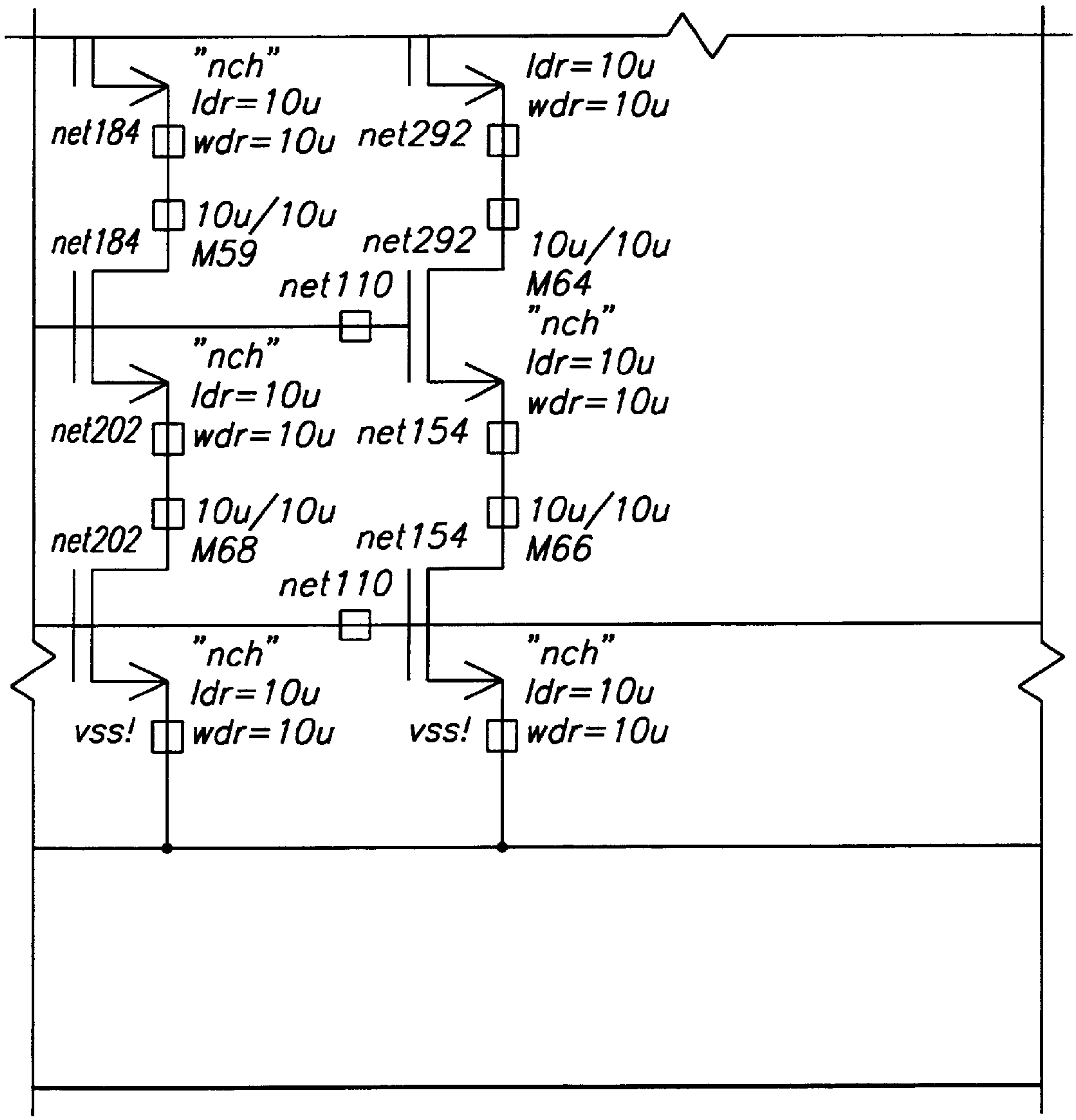
Fig 8.050405EF

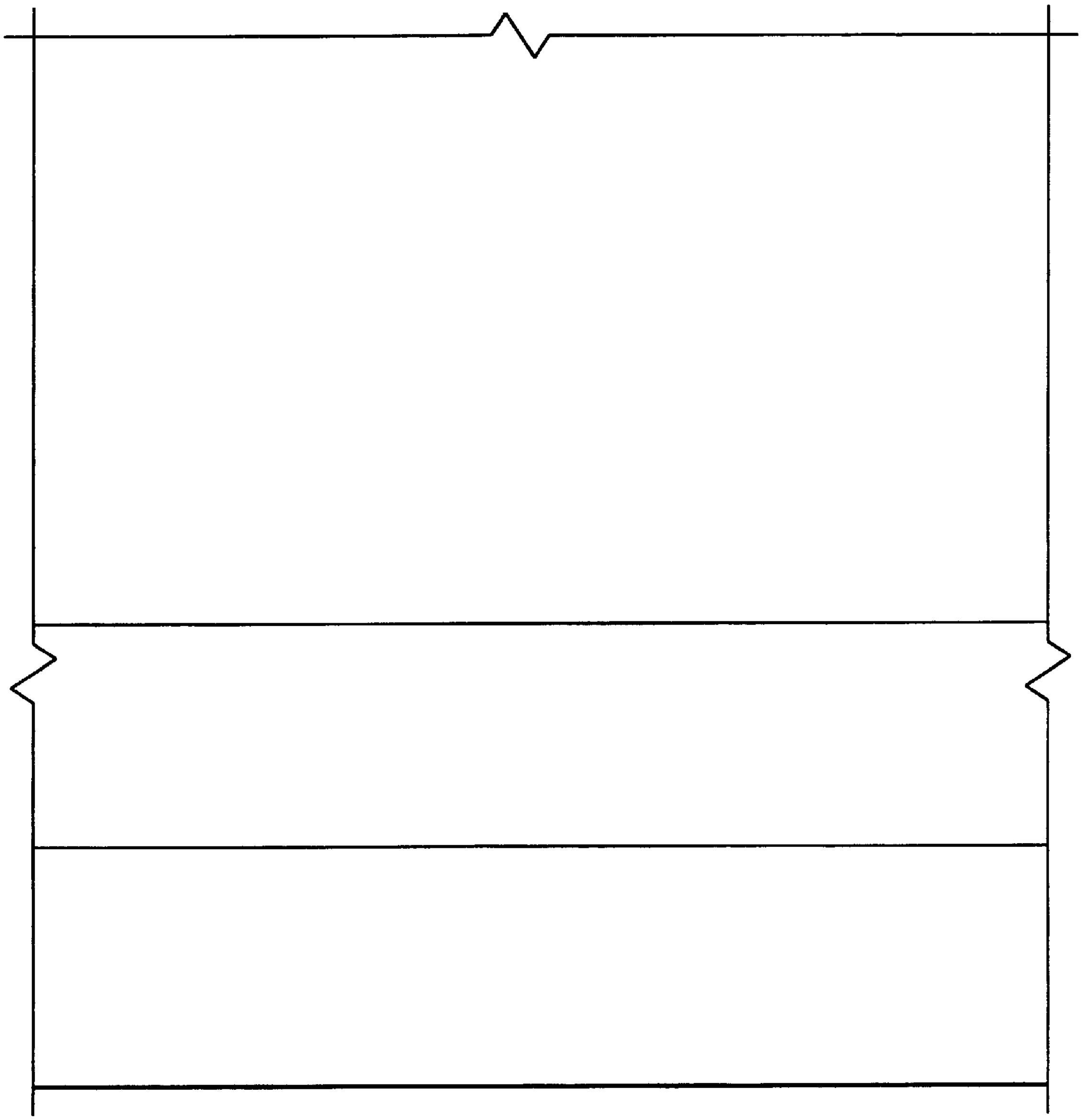
Fig 8.05040SEG

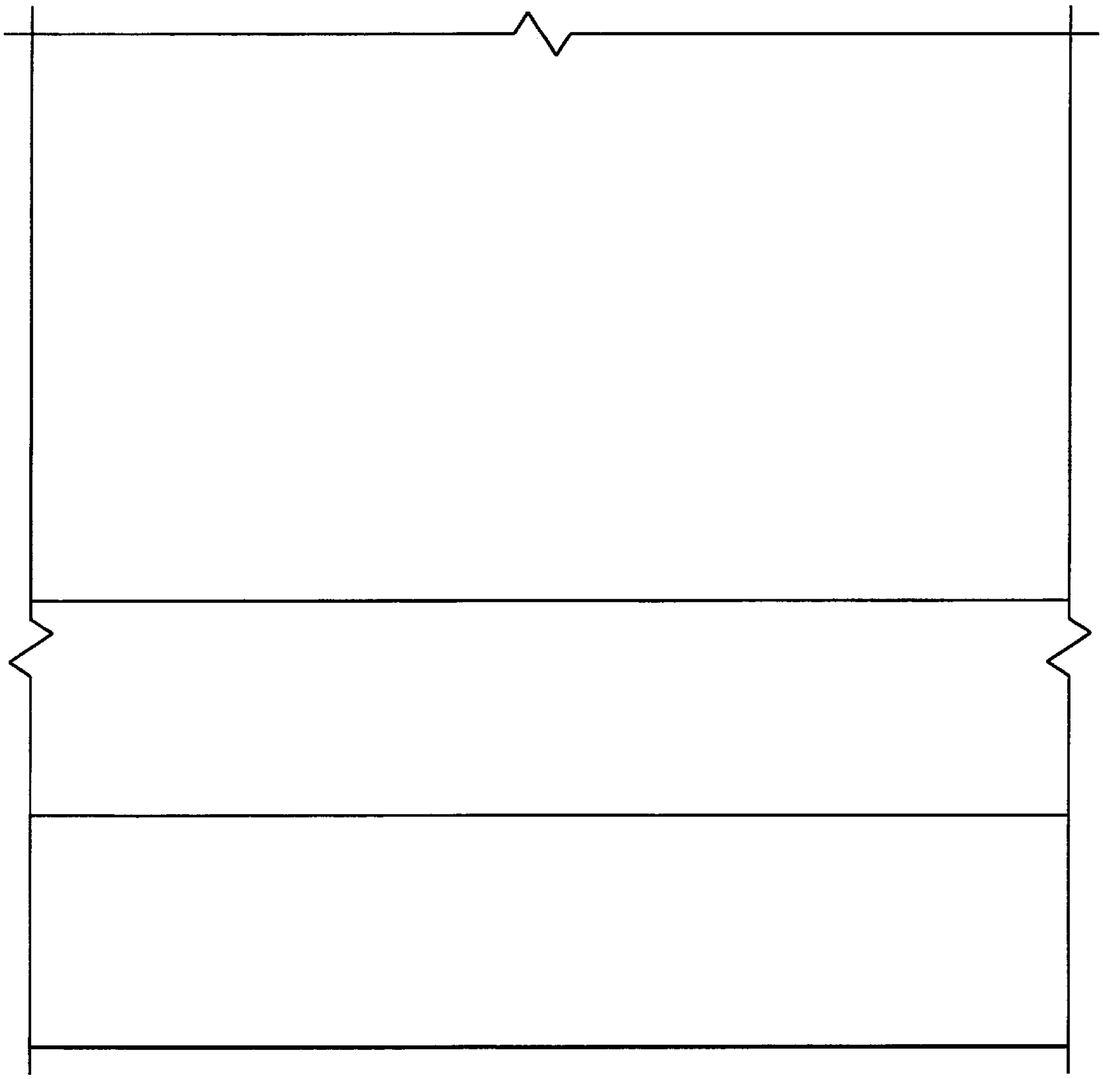
Fig 8.05040SEH

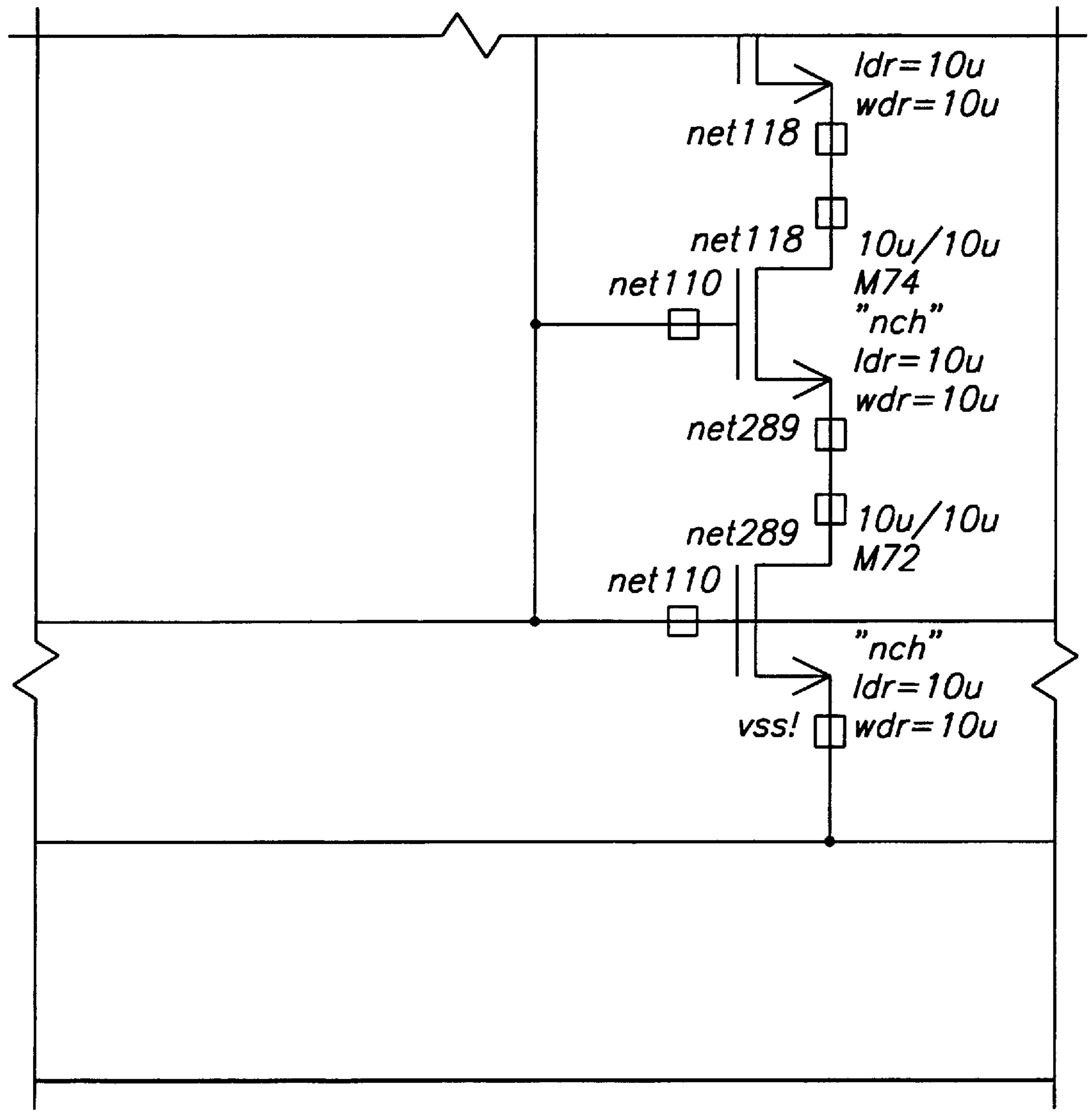
Fig 8.050405E1

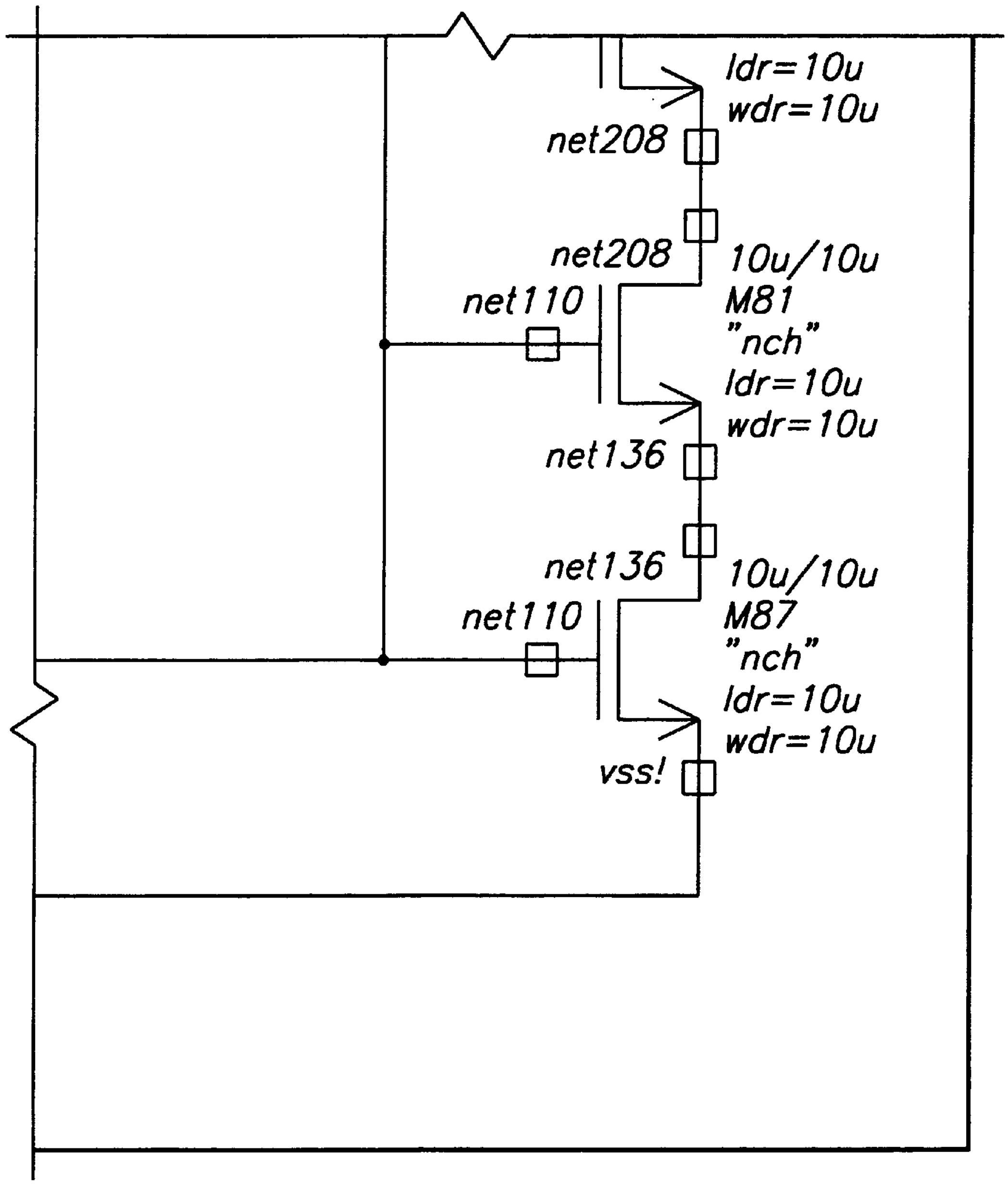
Fig 8.050405E.1

| | | | | | | | | | | | | | |
|---|---|---|---|---|---|---|---|---|---|---|---|---|---|
| 8.0505AA | 8.0505AB | 8.0505AC | 8.0505AD | 8.0505AE | 8.0505AF | 8.0505AG | 8.0505AH | 8.0505AI | 8.0505AJ | 8.0505AK | 8.0505AL | 8.0505AM | 8.0505AN |
| 8.0505BA | 8.0505BB | 8.0505BC | 8.0505BD | 8.0505BE | 8.0505BF | 8.0505BG | 8.0505BH | 8.0505BI | 8.0505BJ | 8.0505BK | 8.0505BL | 8.0505BM | 8.0505BN |
| 8.0505CA | 8.0505CB | 8.0505CC | 8.0505CD | 8.0505CE | 8.0505CF | 8.0505CG | 8.0505CH | 8.0505CI | 8.0505CJ | 8.0505CK | 8.0505CL | 8.0505CM | 8.0505CN |
| 8.0505DA | 8.0505DB | 8.0505DC | 8.0505DD | 8.0505DE | 8.0505DF | 8.0505DG | 8.0505DH | 8.0505DI | 8.0505DJ | 8.0505DK | 8.0505DL | 8.0505DM | 8.0505DN |
| 8.0505EA | 8.0505EB | 8.0505EC | 8.0505ED | 8.0505EE | 8.0505EF | | | | | | | | |

Fig 8.0505

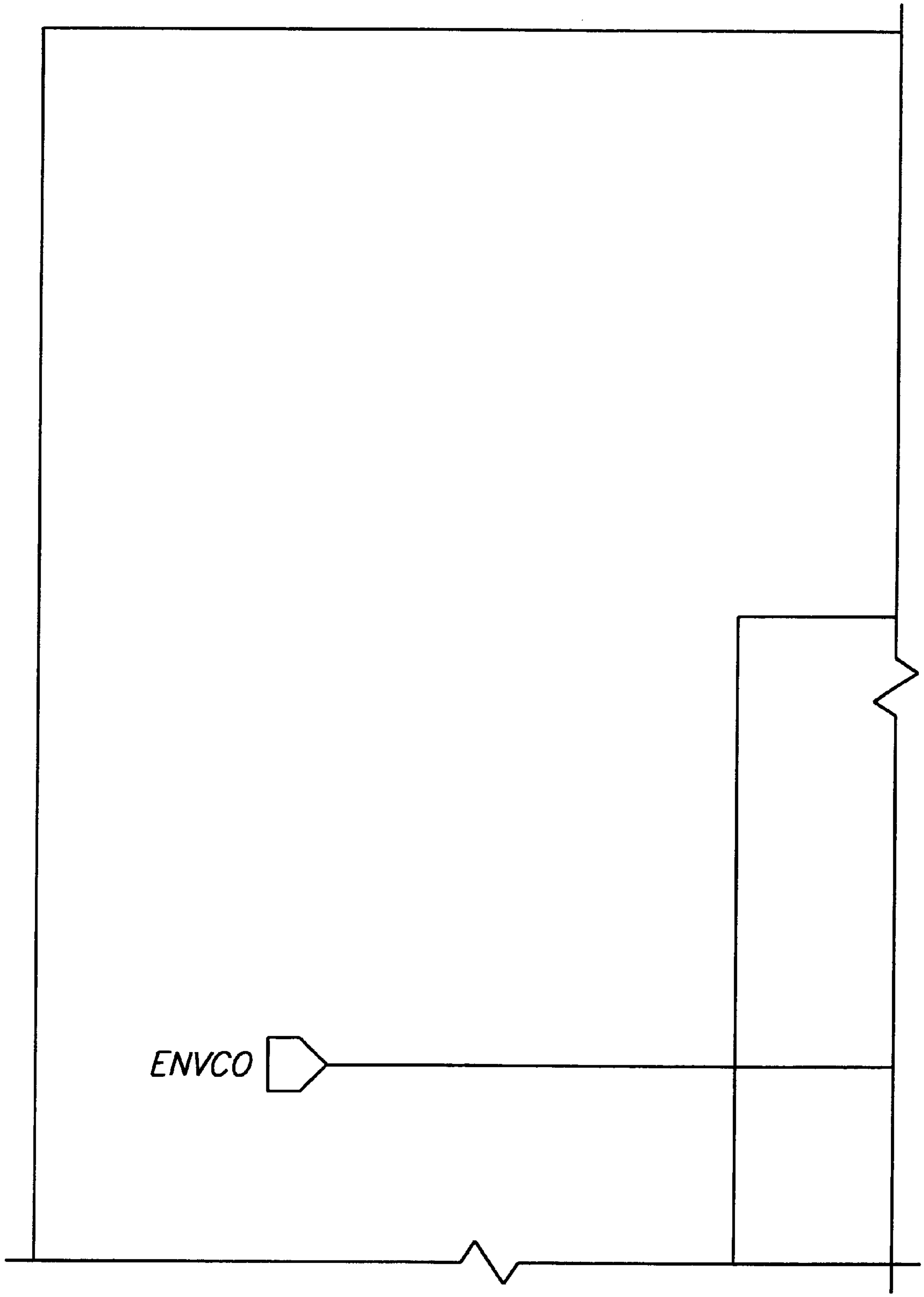
Fig 8.050SAA

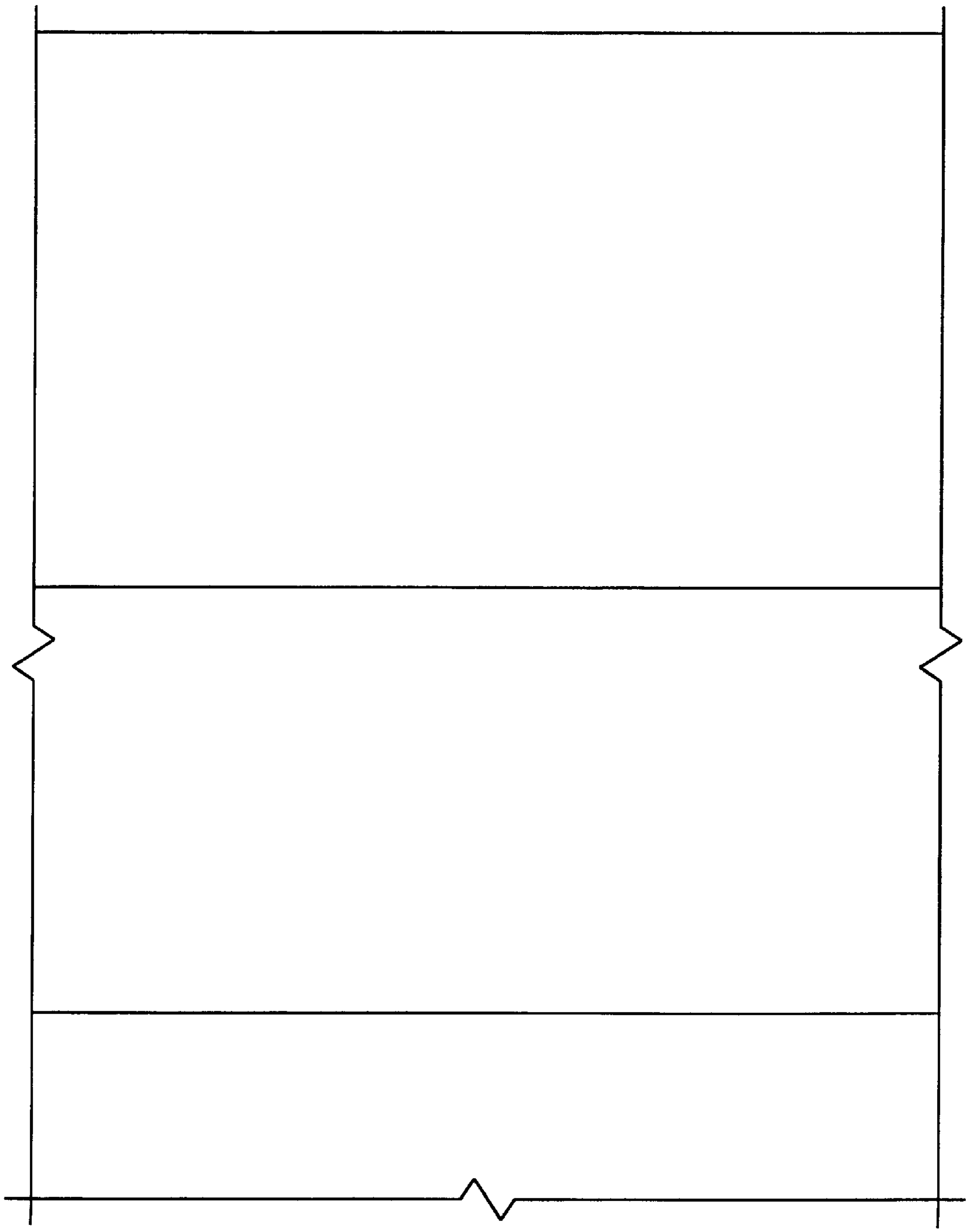
FIG. 8.050SAB

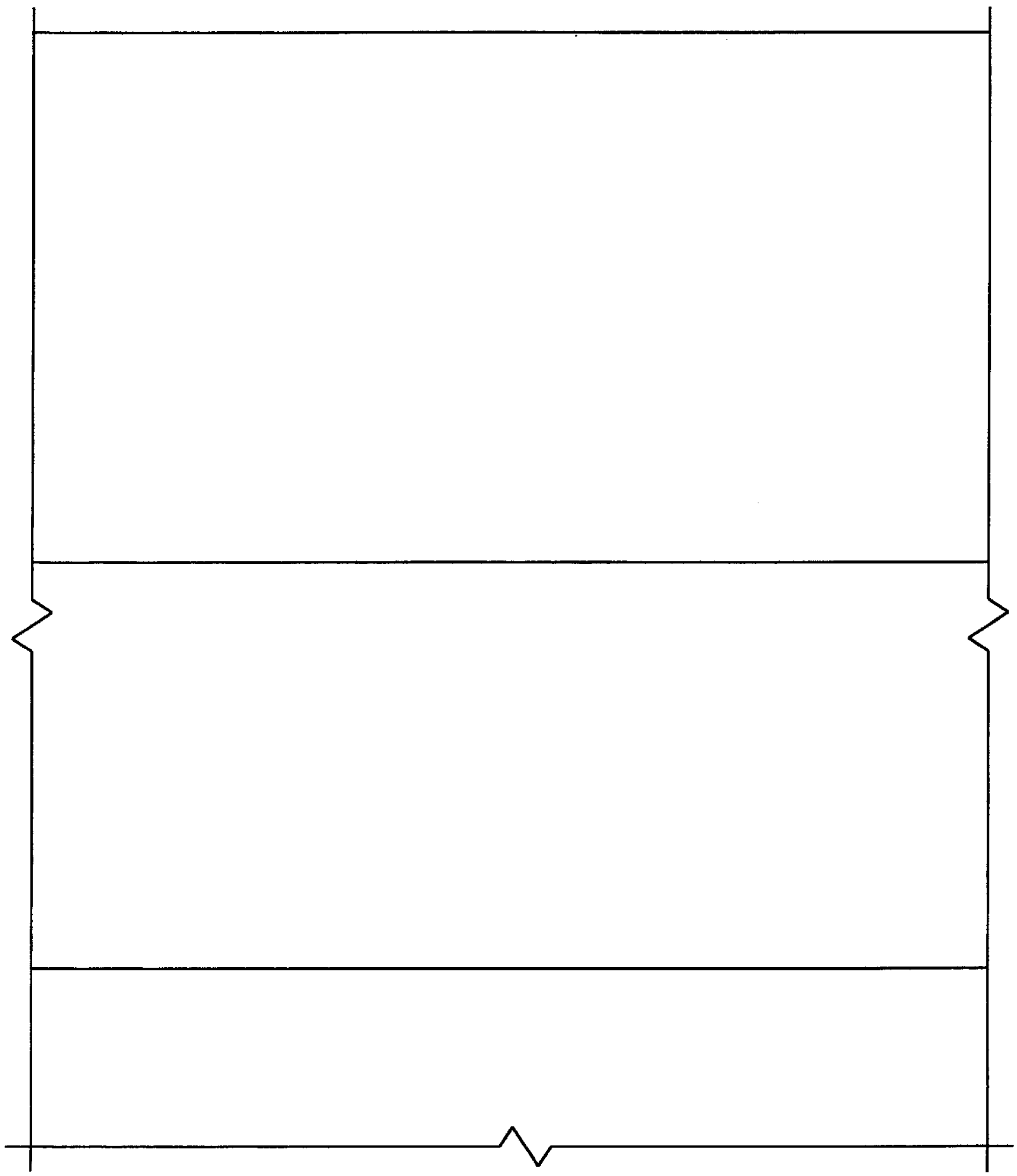
Fig 8.0505AC

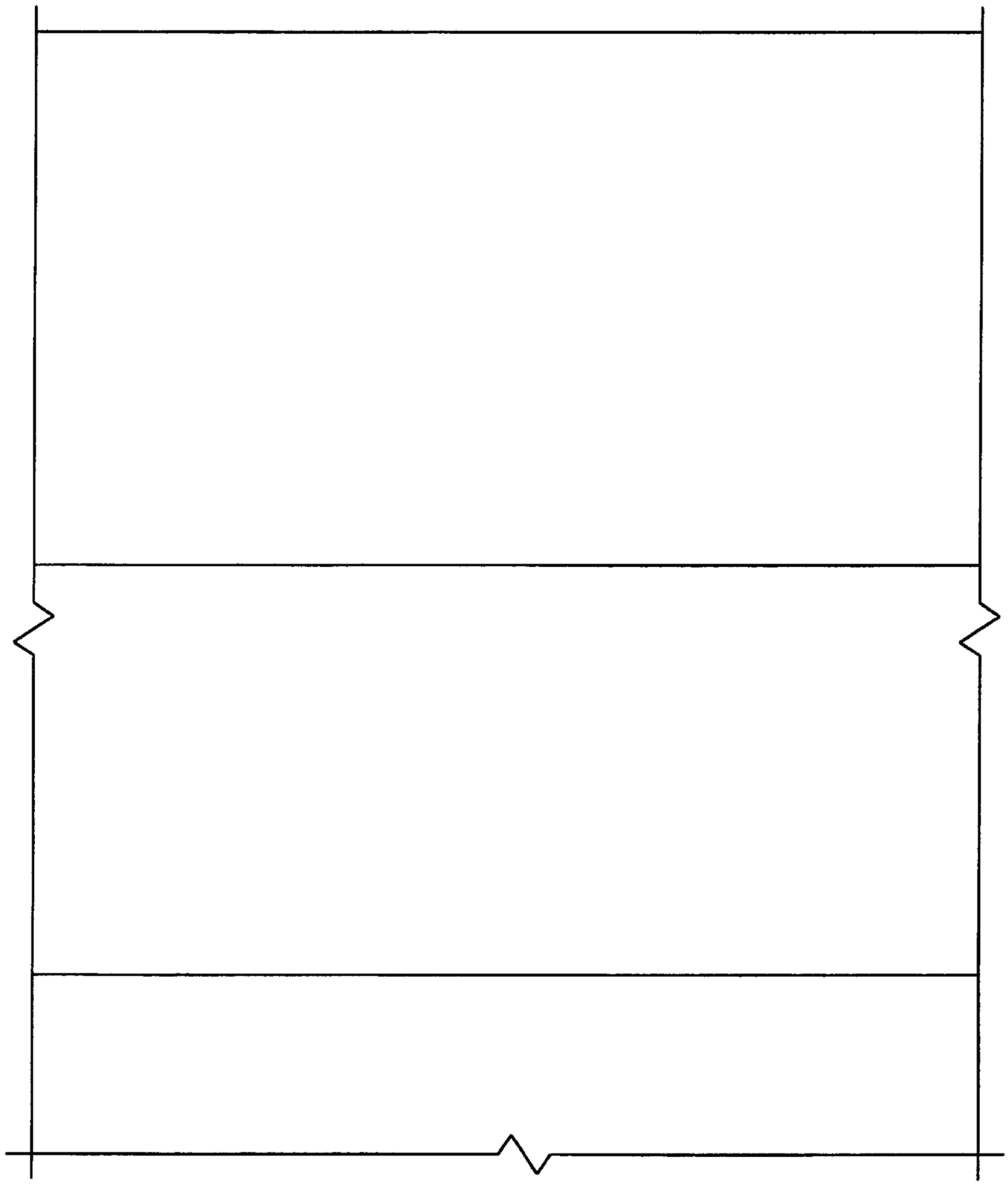
Fig 8.050SAD

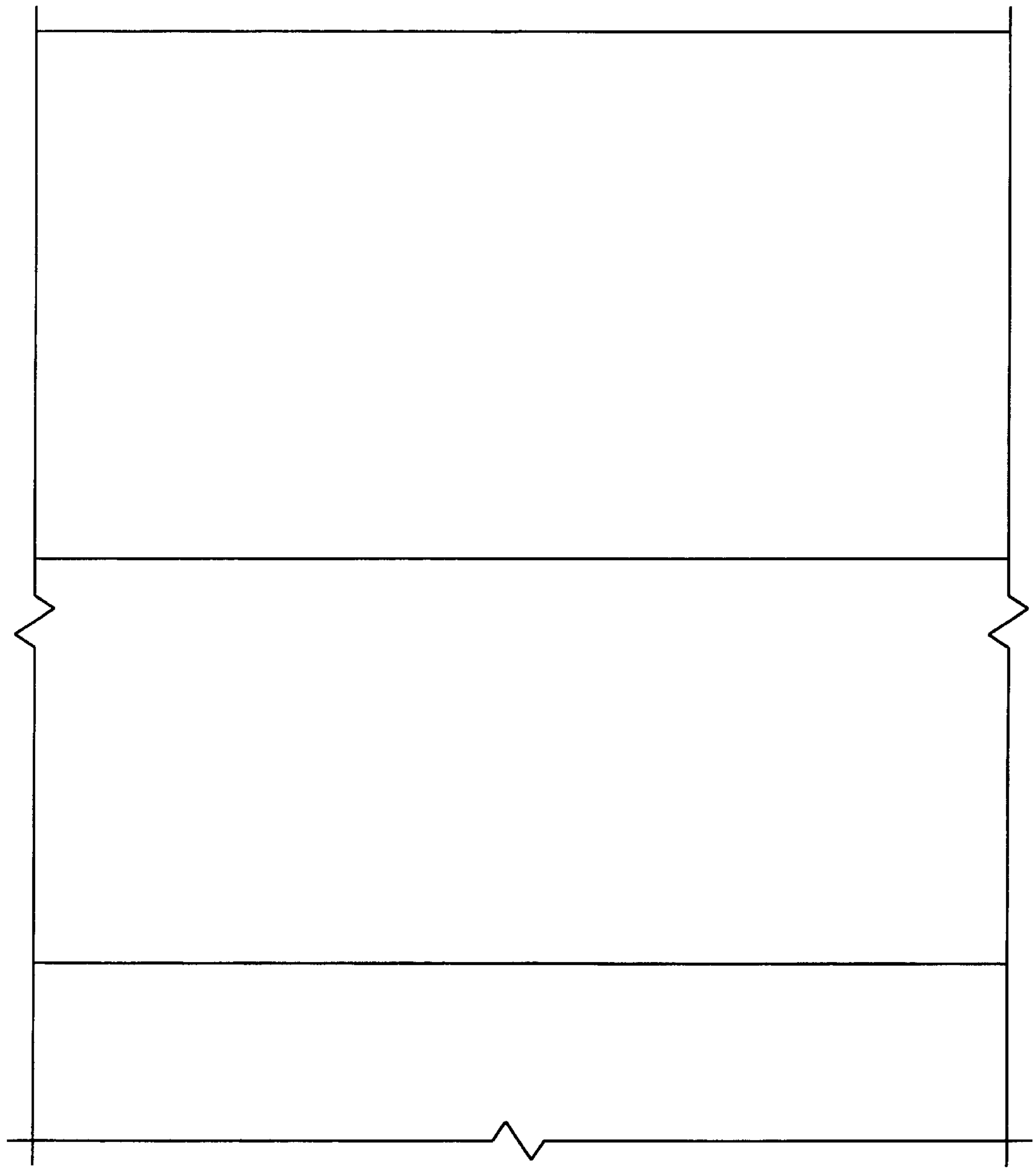
Fig 8.0505AE

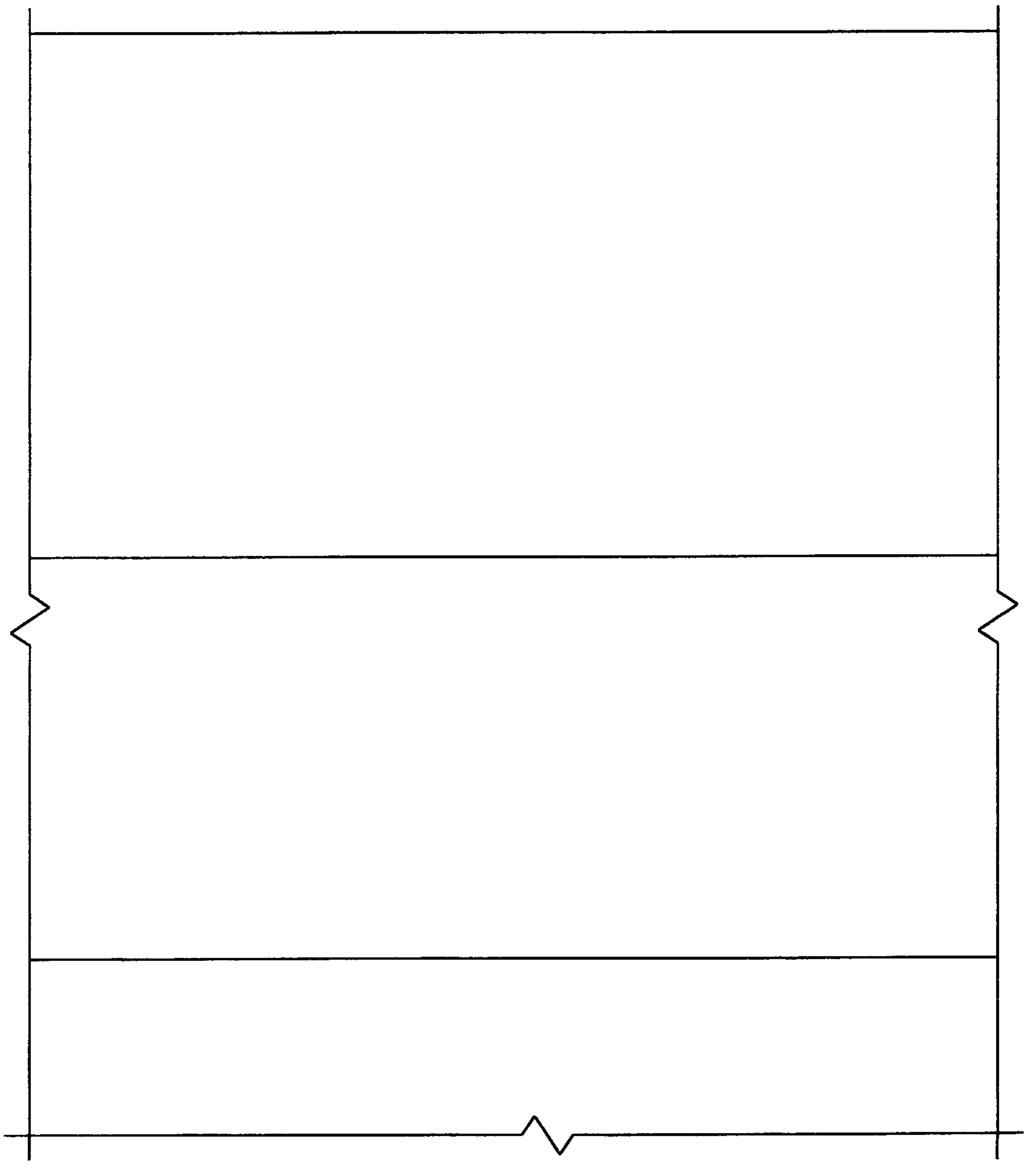
Fig 8.0505AF

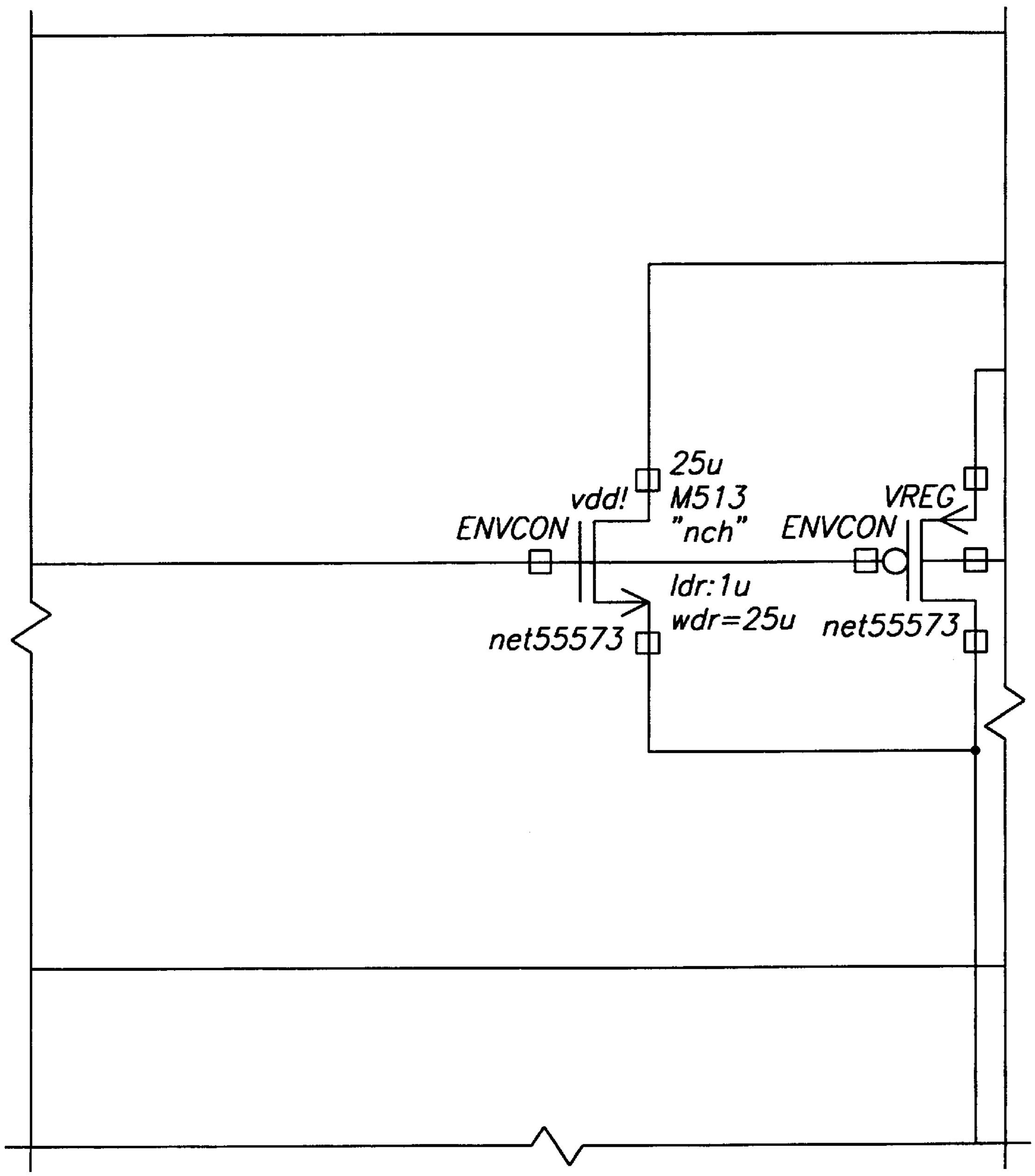
Fig 8.050SAG

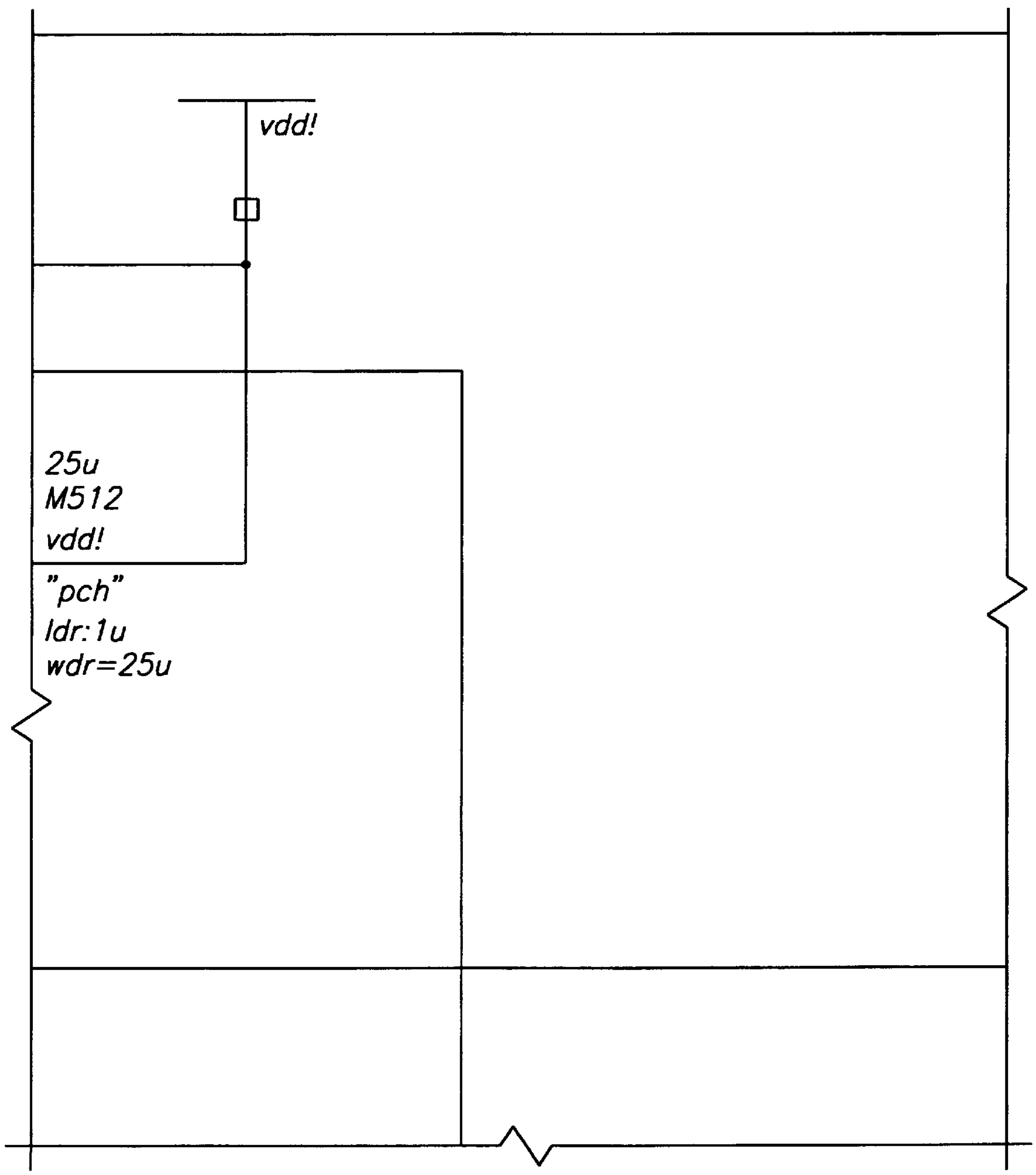
Fig 8.05O5AH

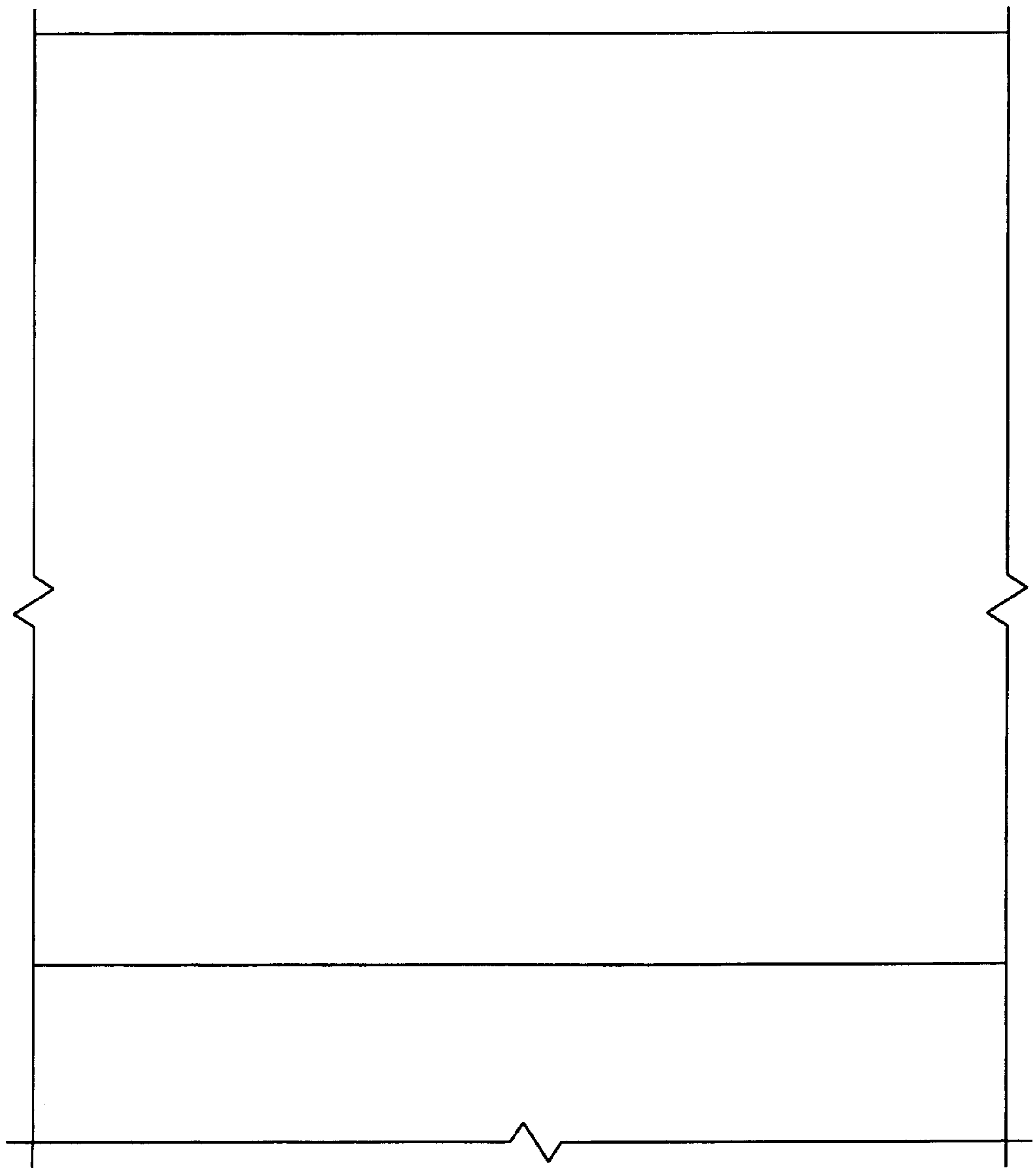
Fig 8.0505AI

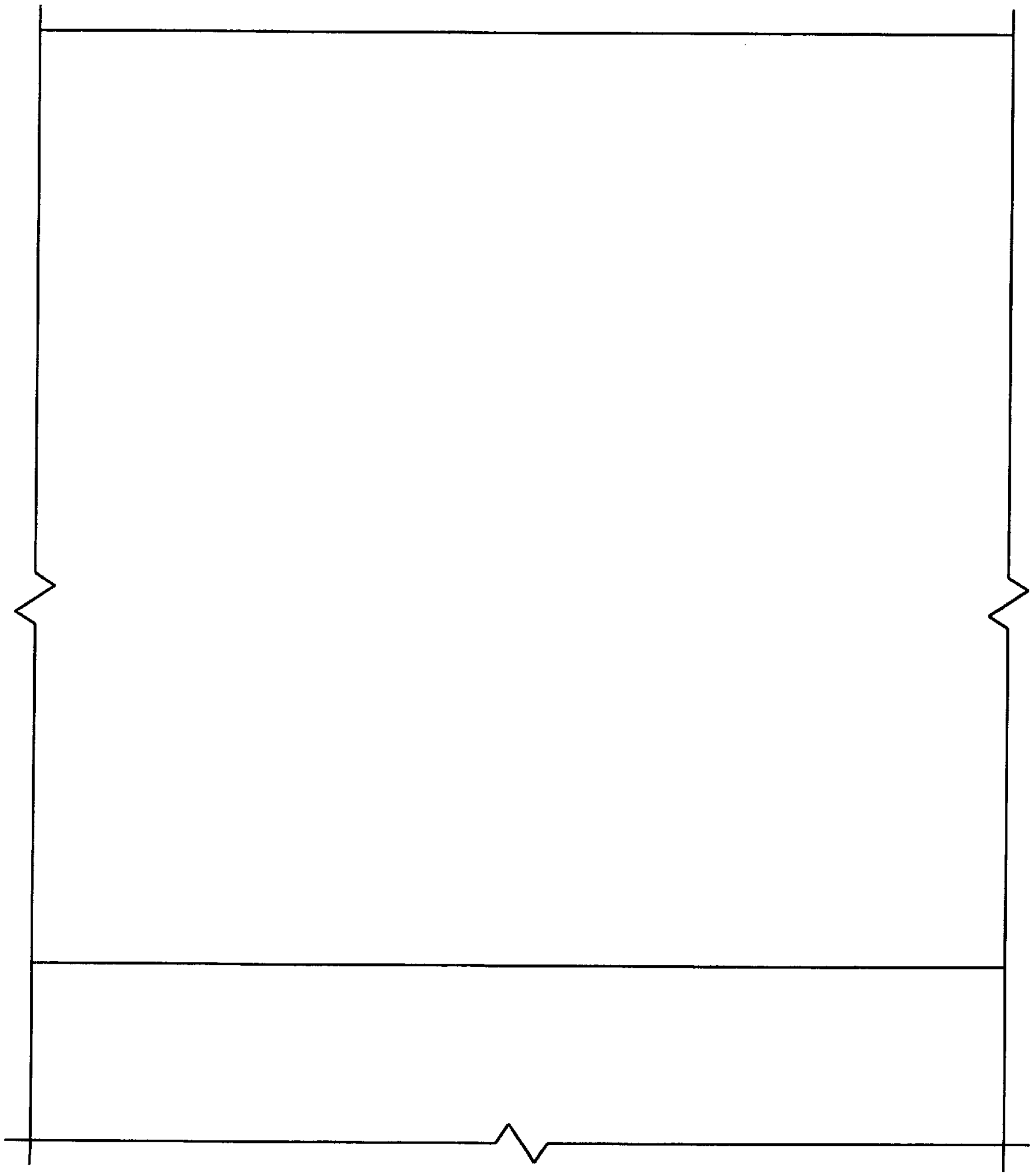
Fig 8.0505AJ

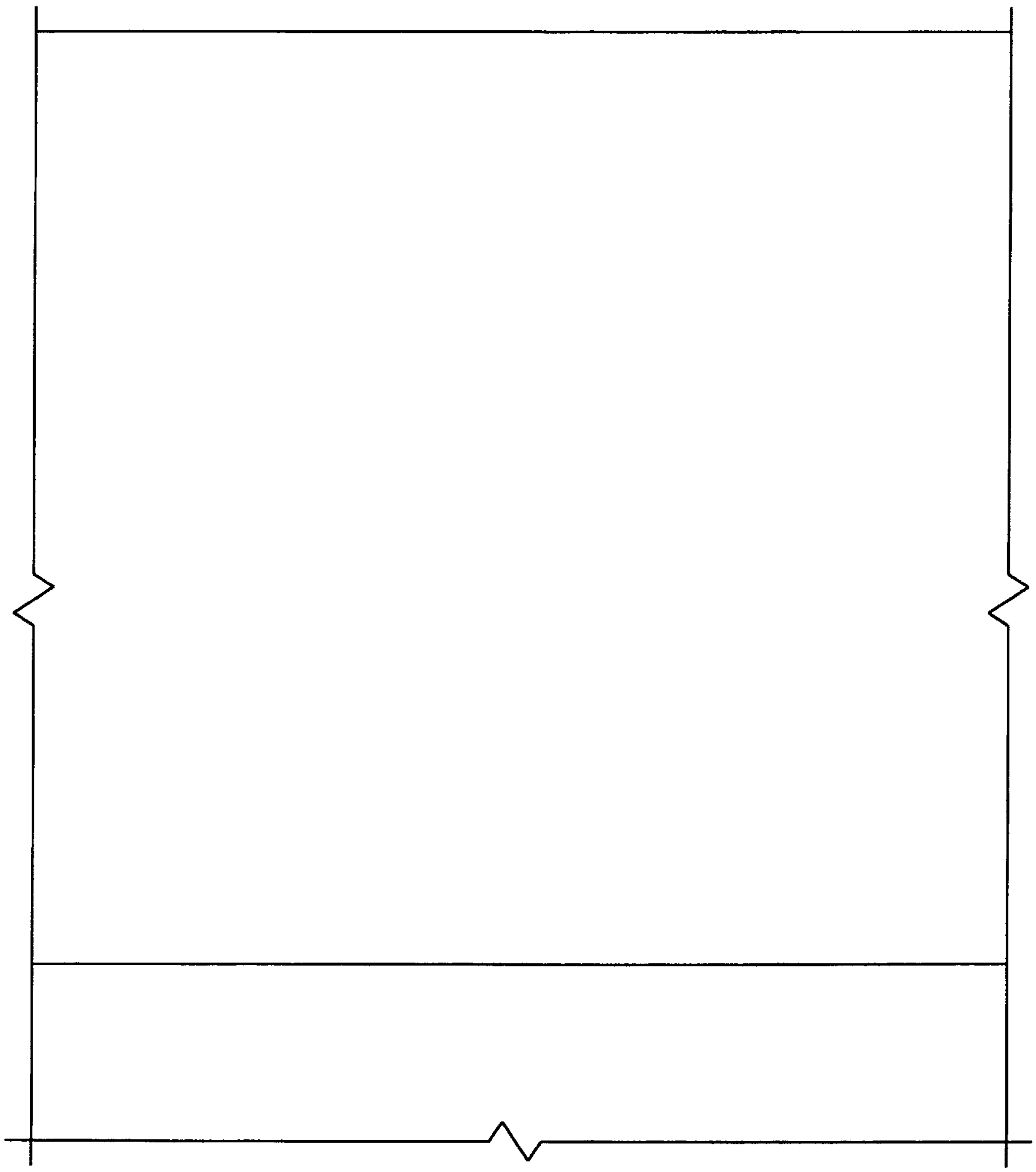
Fig 8.050SAK

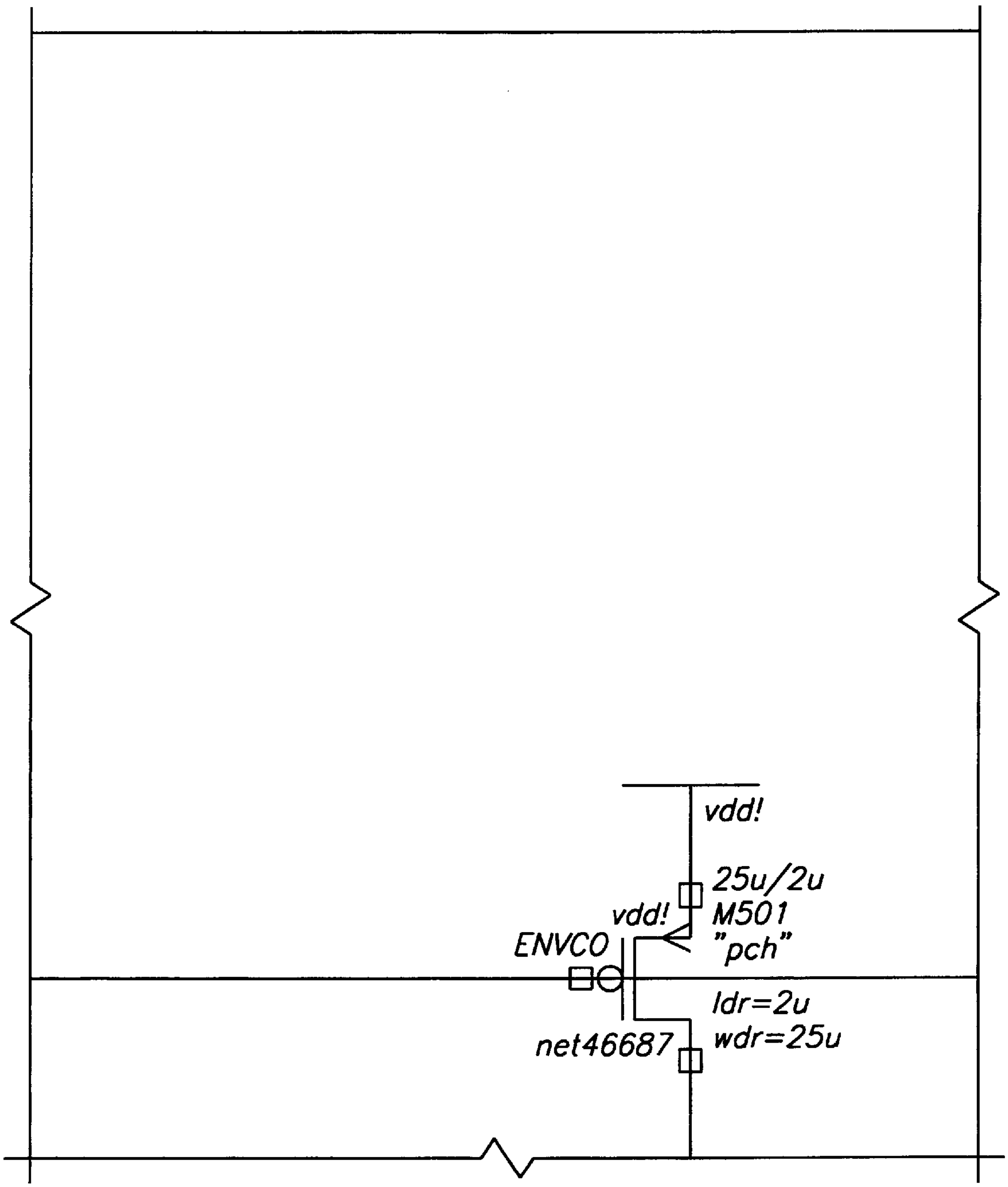
Fig 8.050SAL

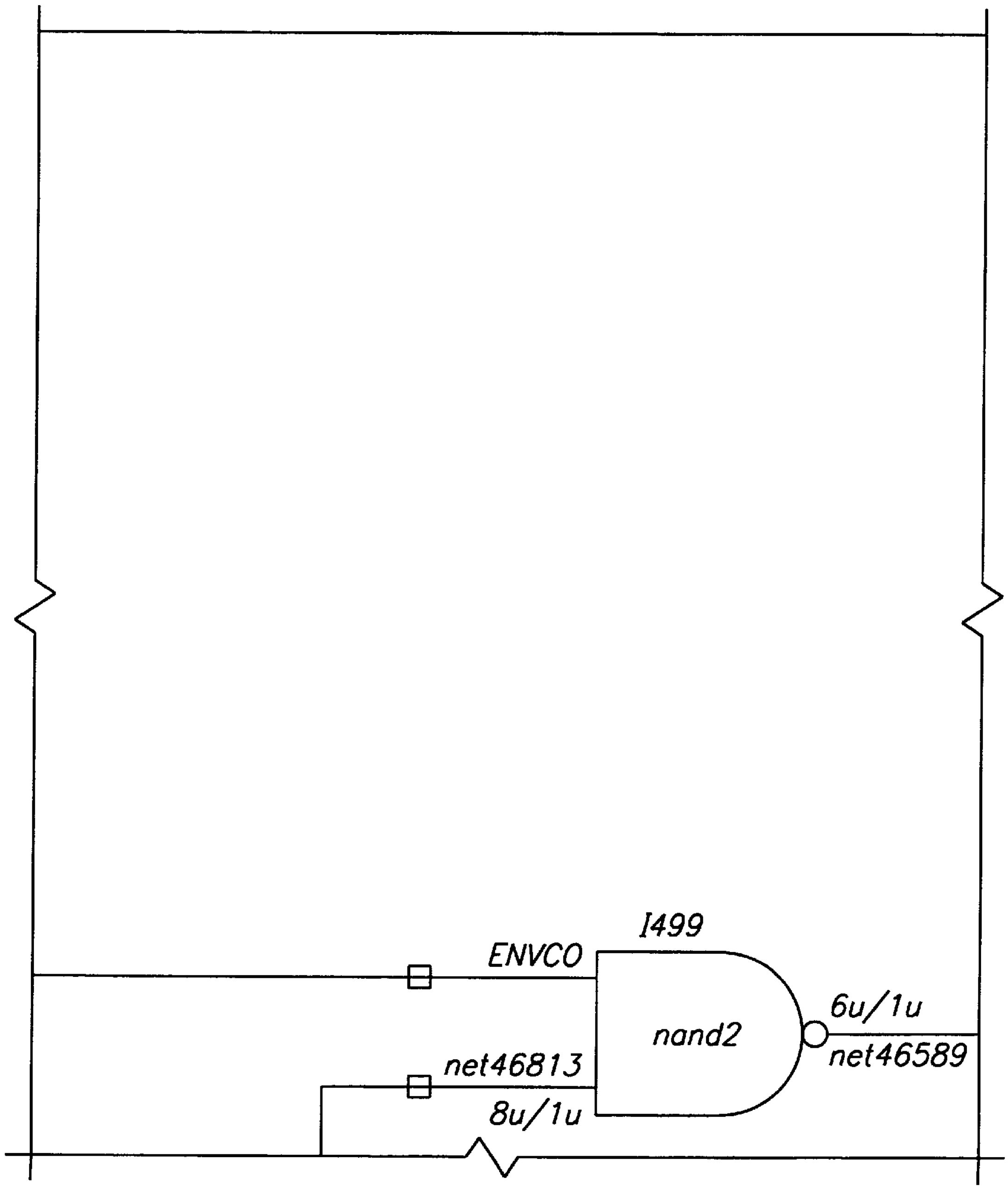
Fig 8.050AM

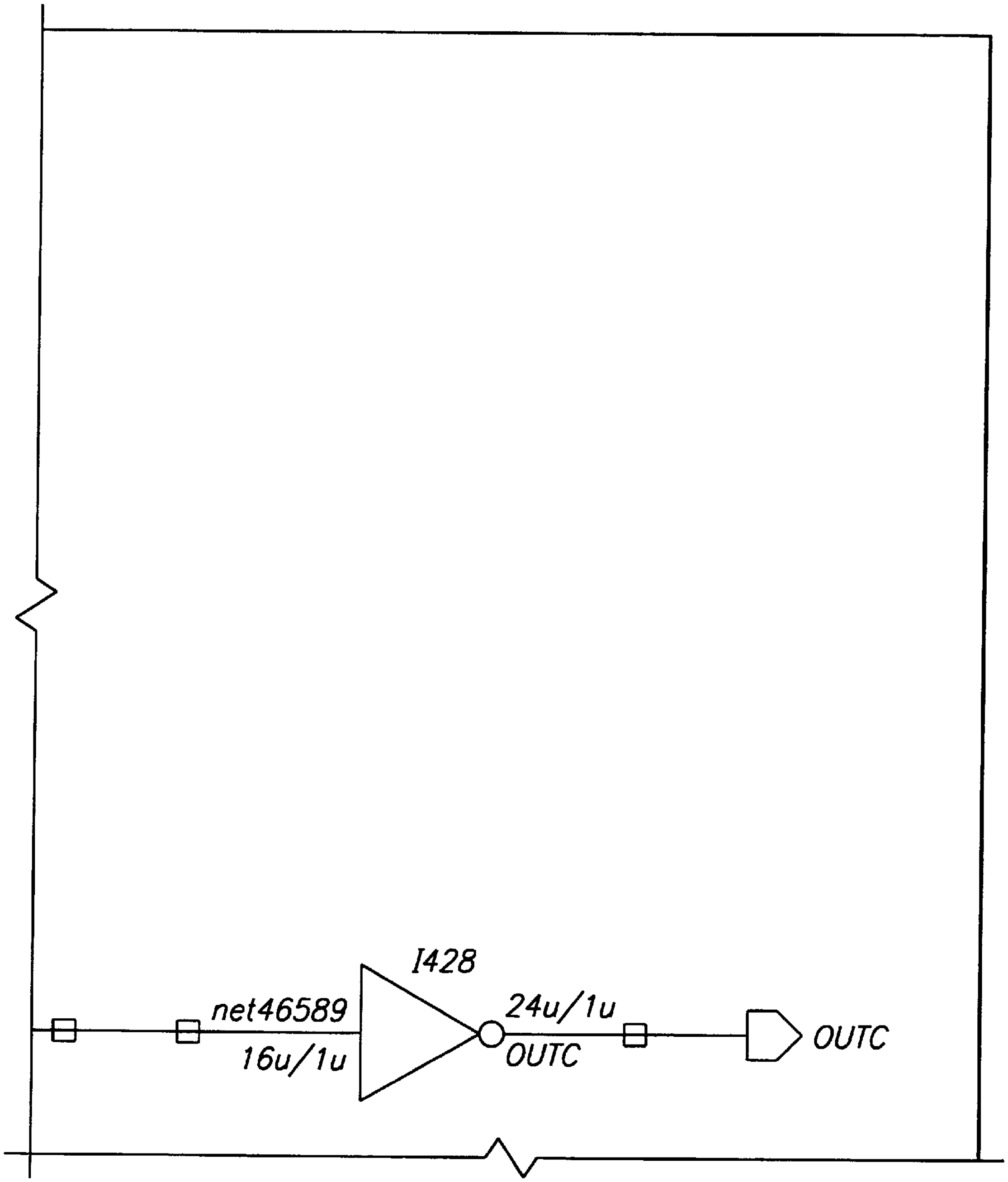
Fig. 8.050SAN

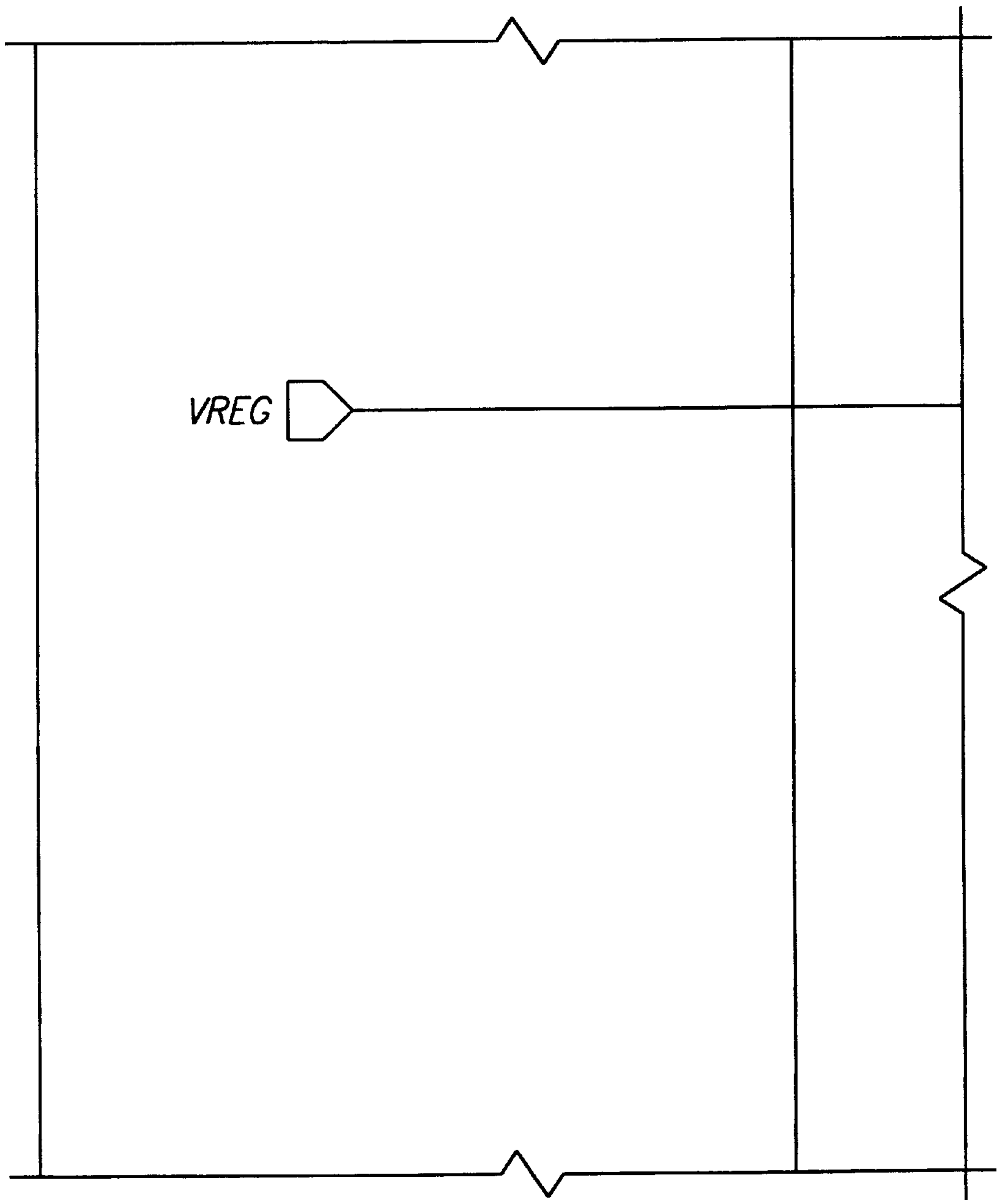
Fig 8.0505BA

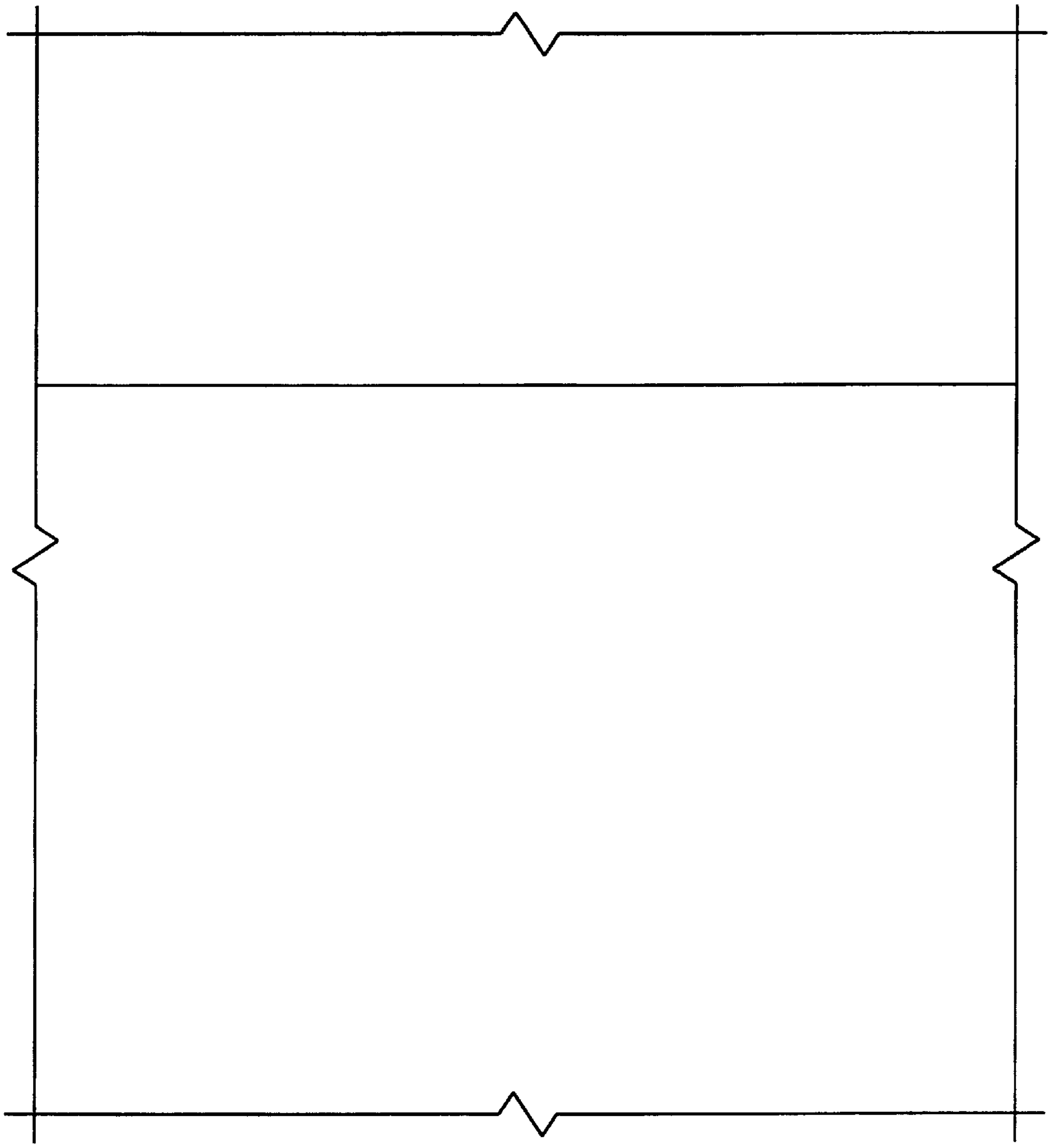
Fig 8.050BB

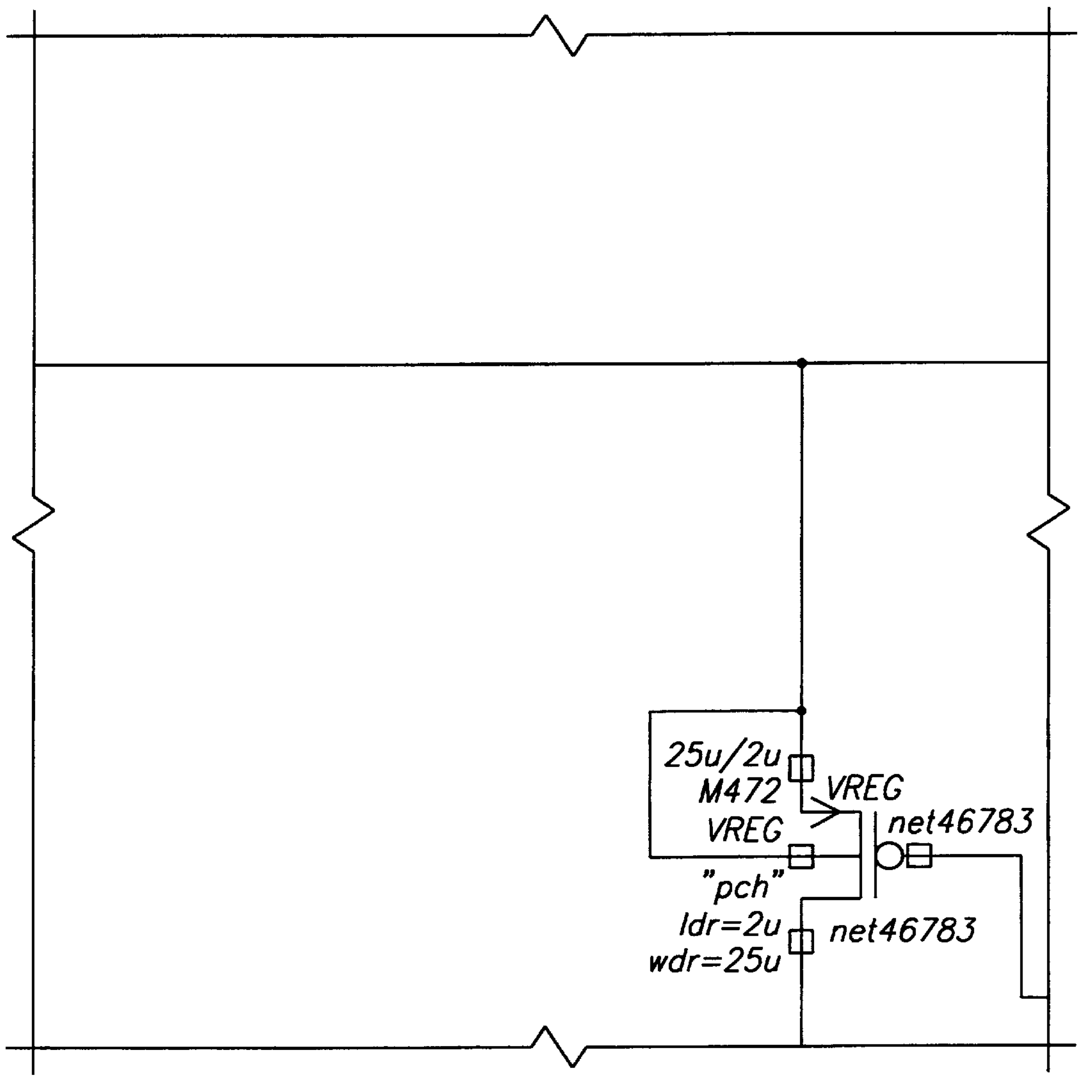
Fig 8.0505BC

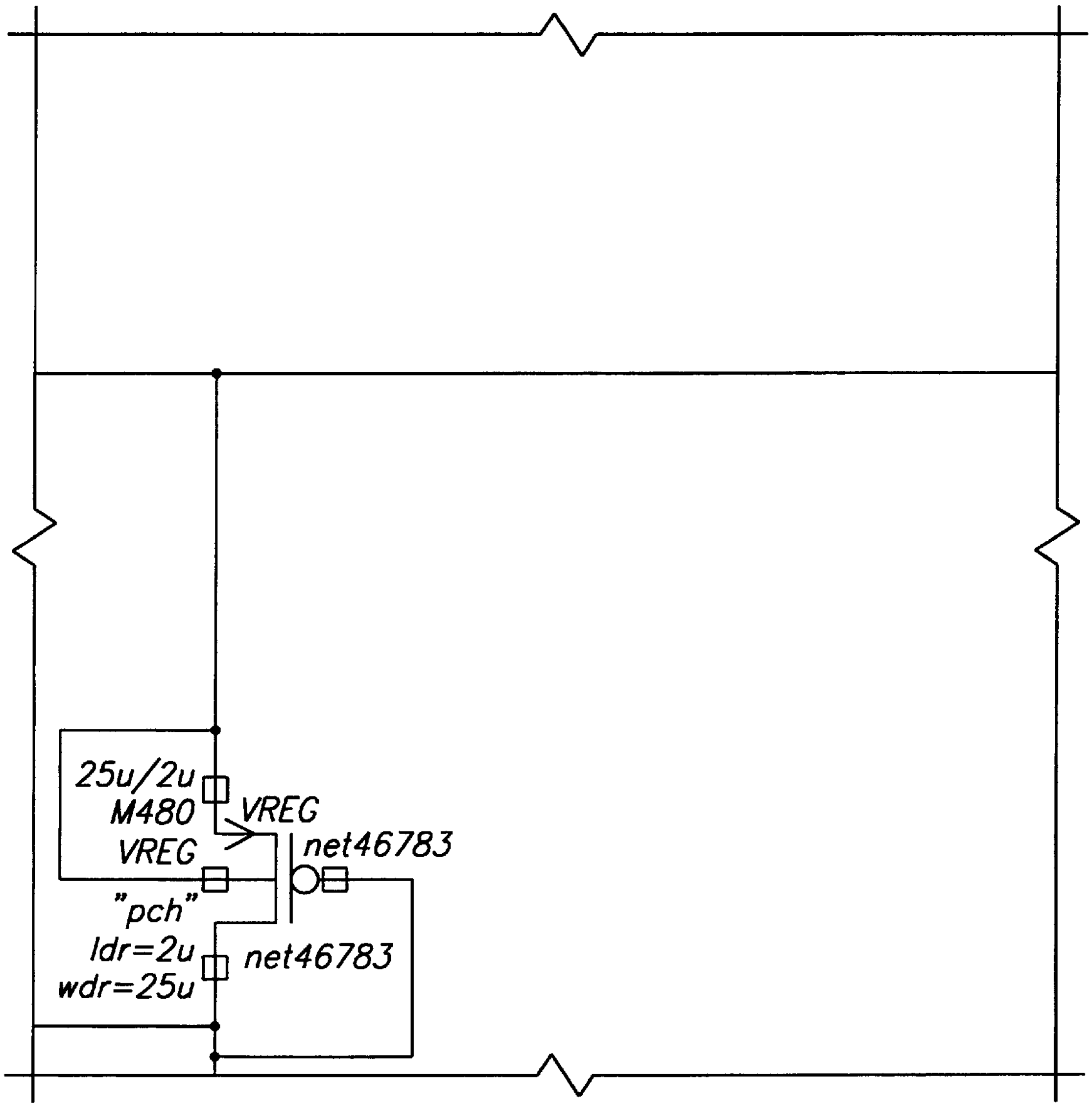
Fig 8.050SBD

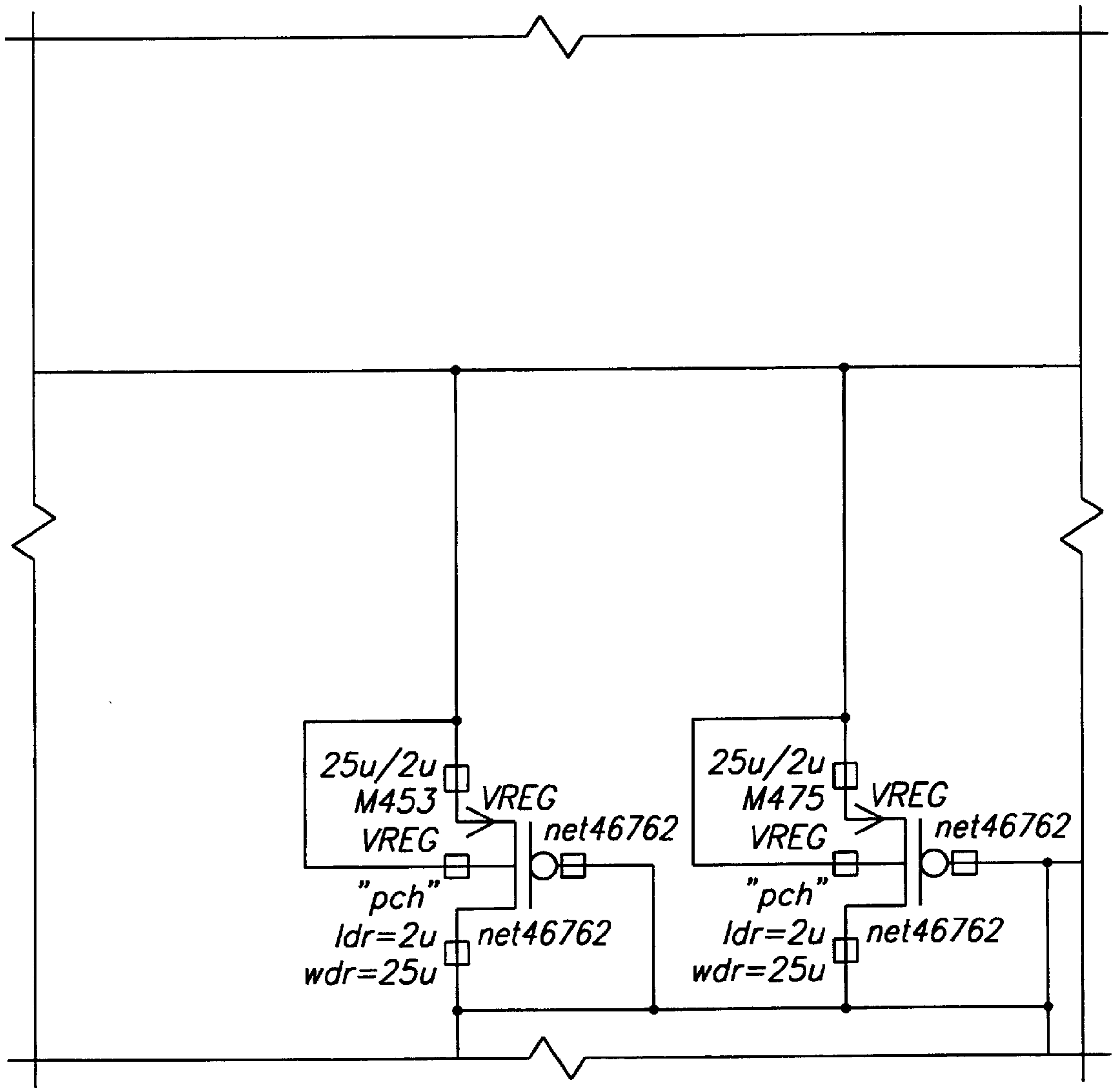
Fig. 8.0505BE

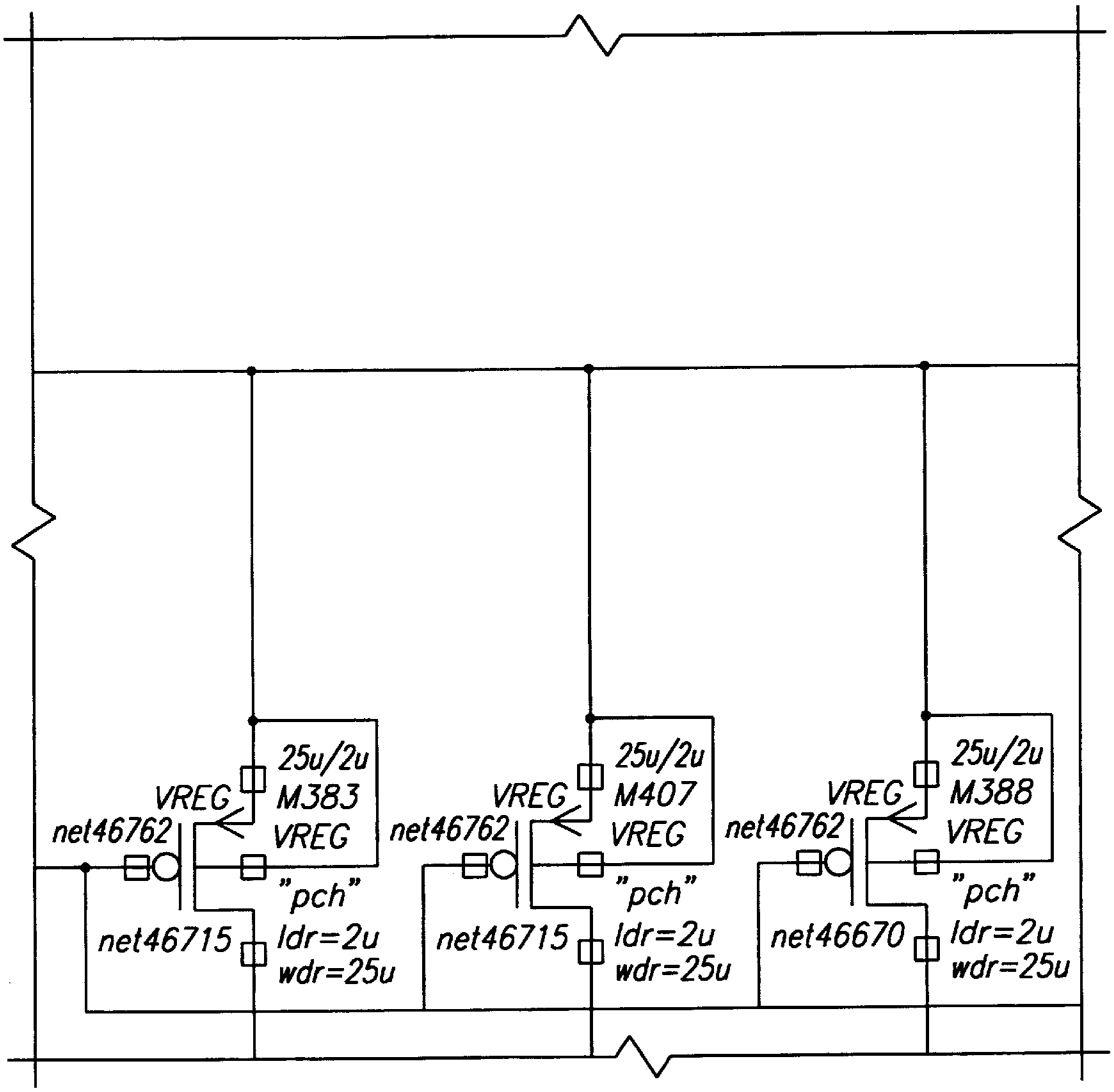
Fig 8.050SBF

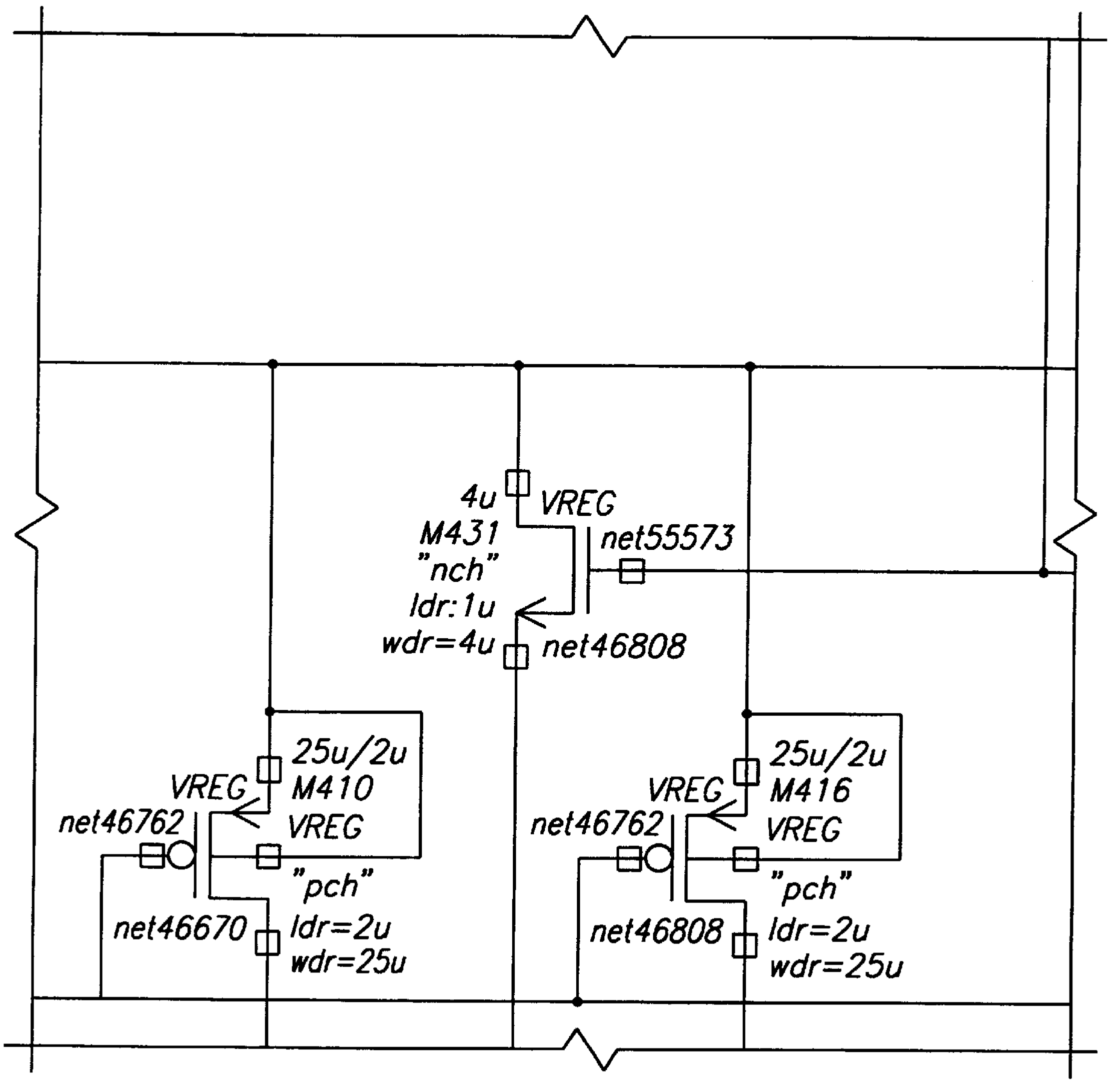
Fig 8.050586

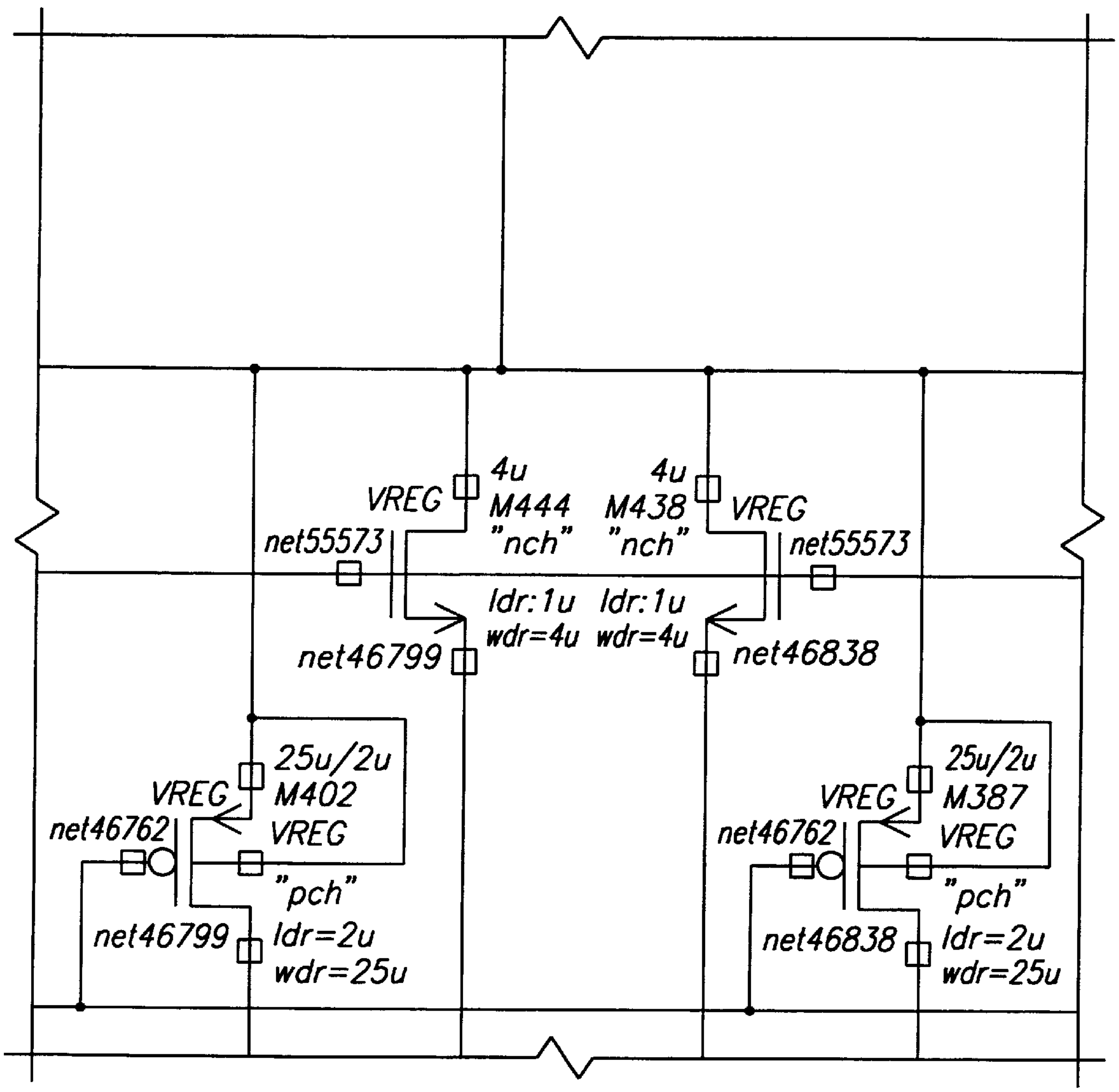
Fig 8.0505BH

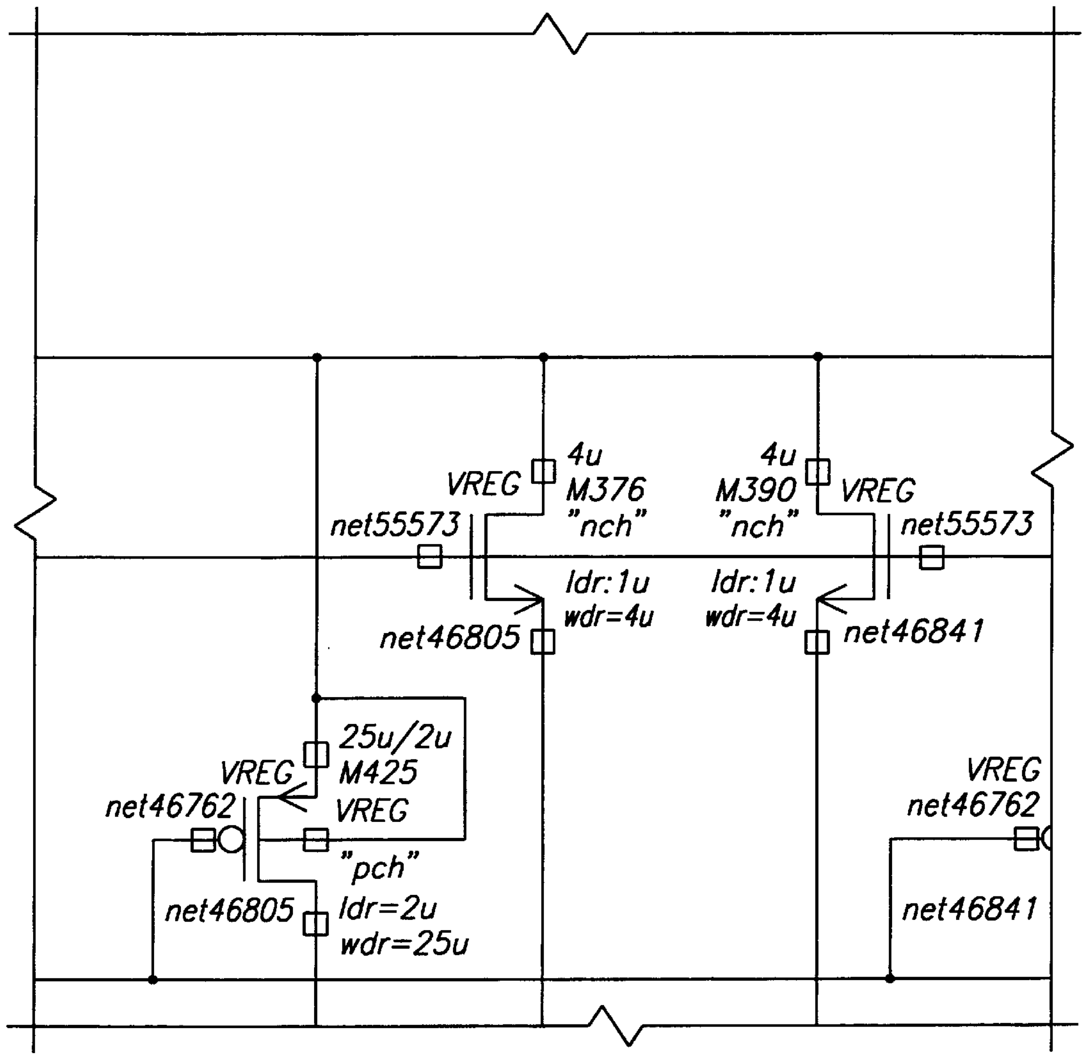
Fig 8.050SBI

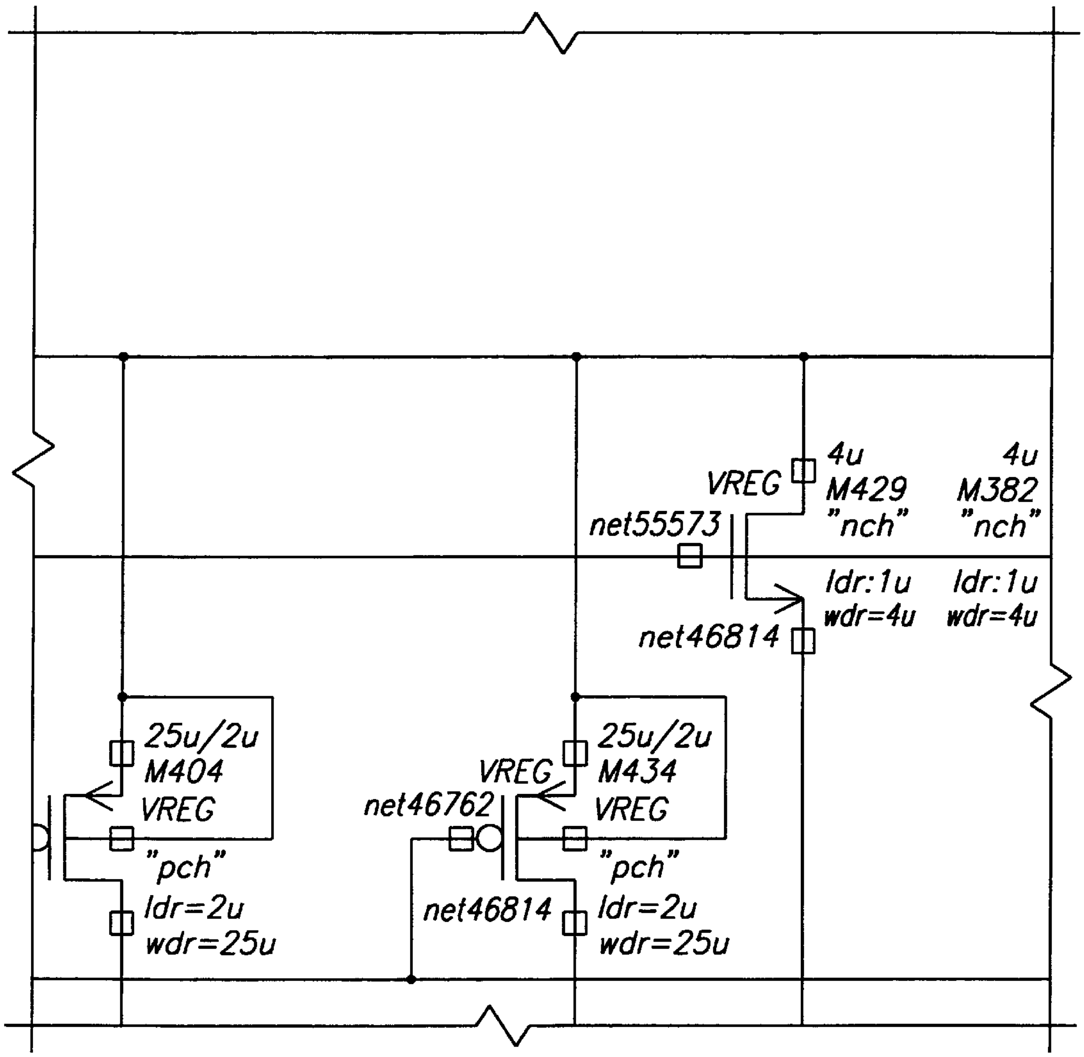
Fig 8.050SBa

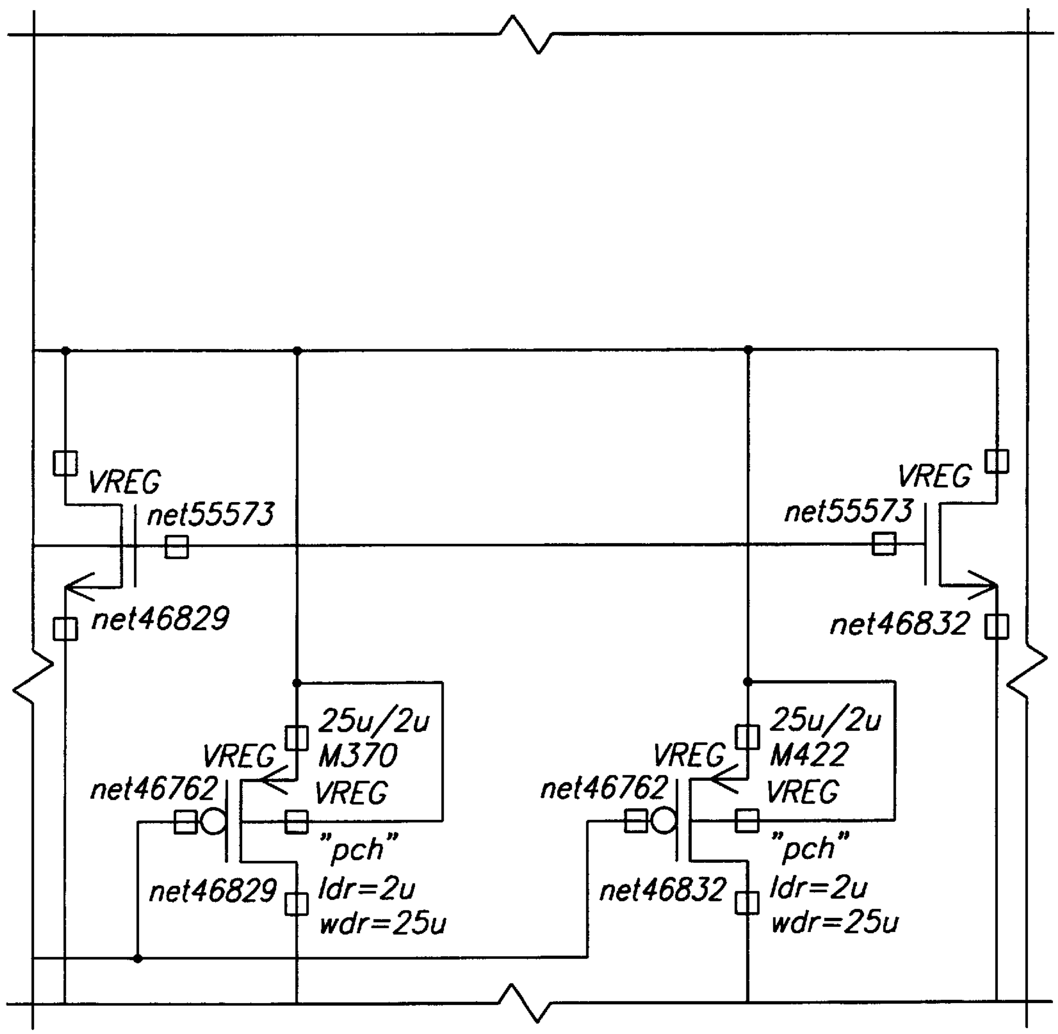
Fig 8.0505BK

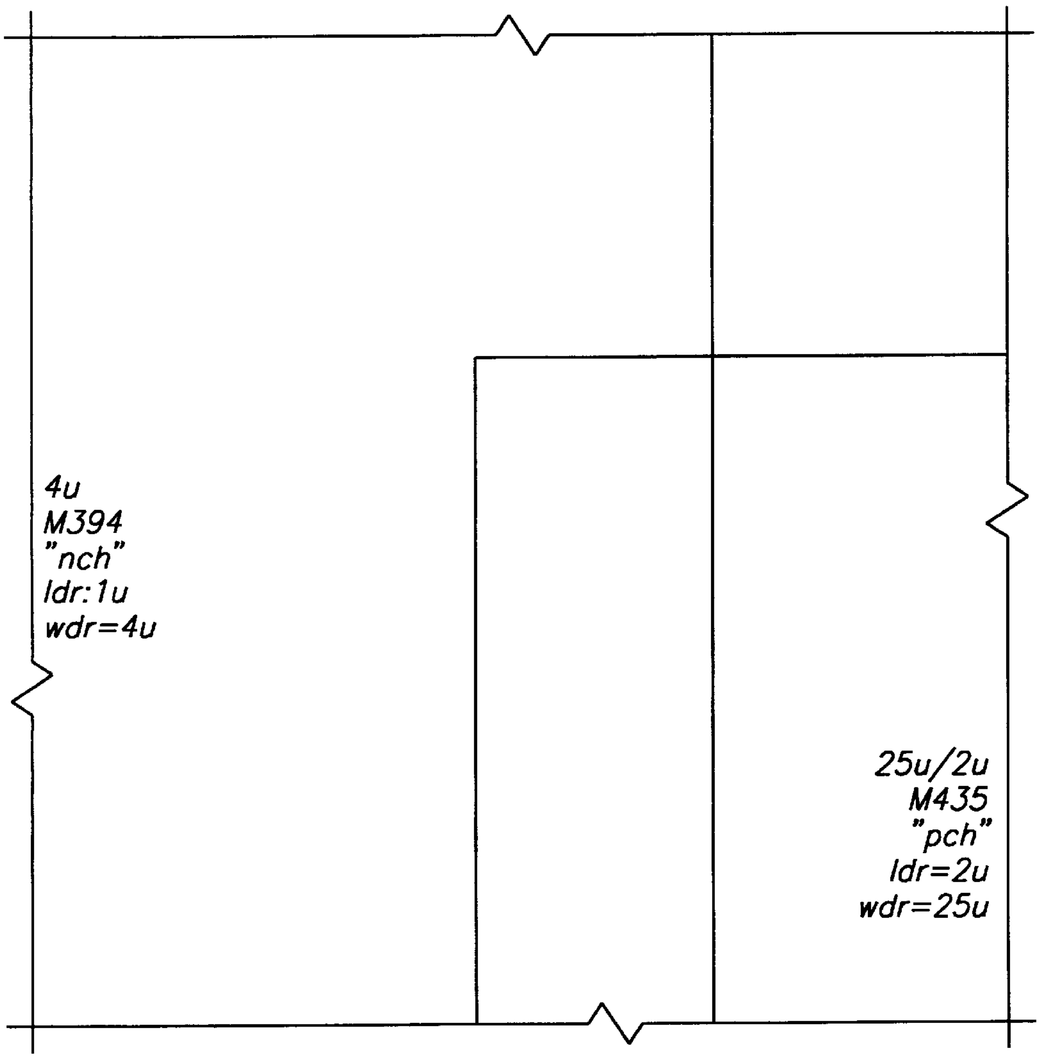
Fig 8.0505BL

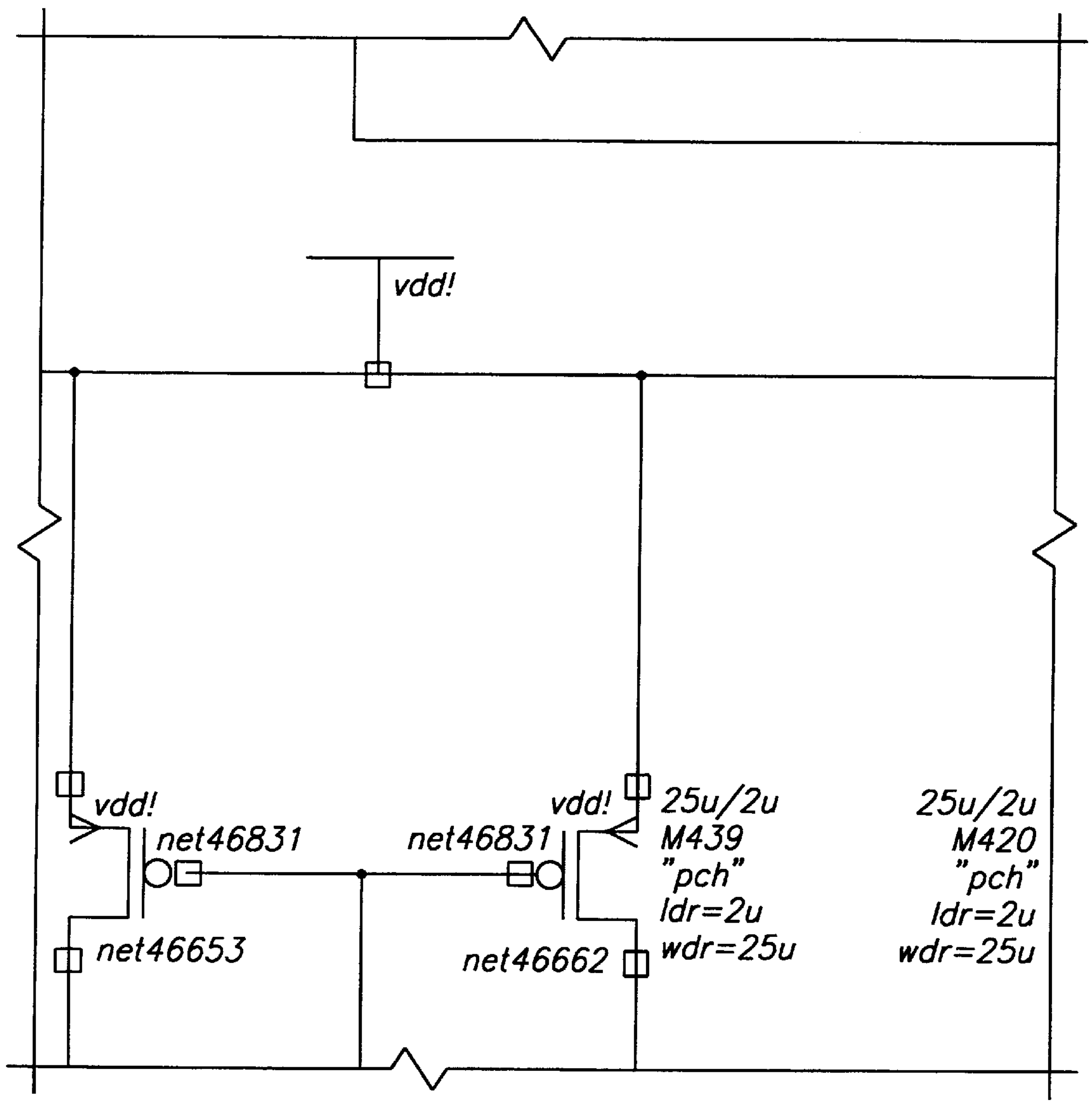
Fig 8.0505BM

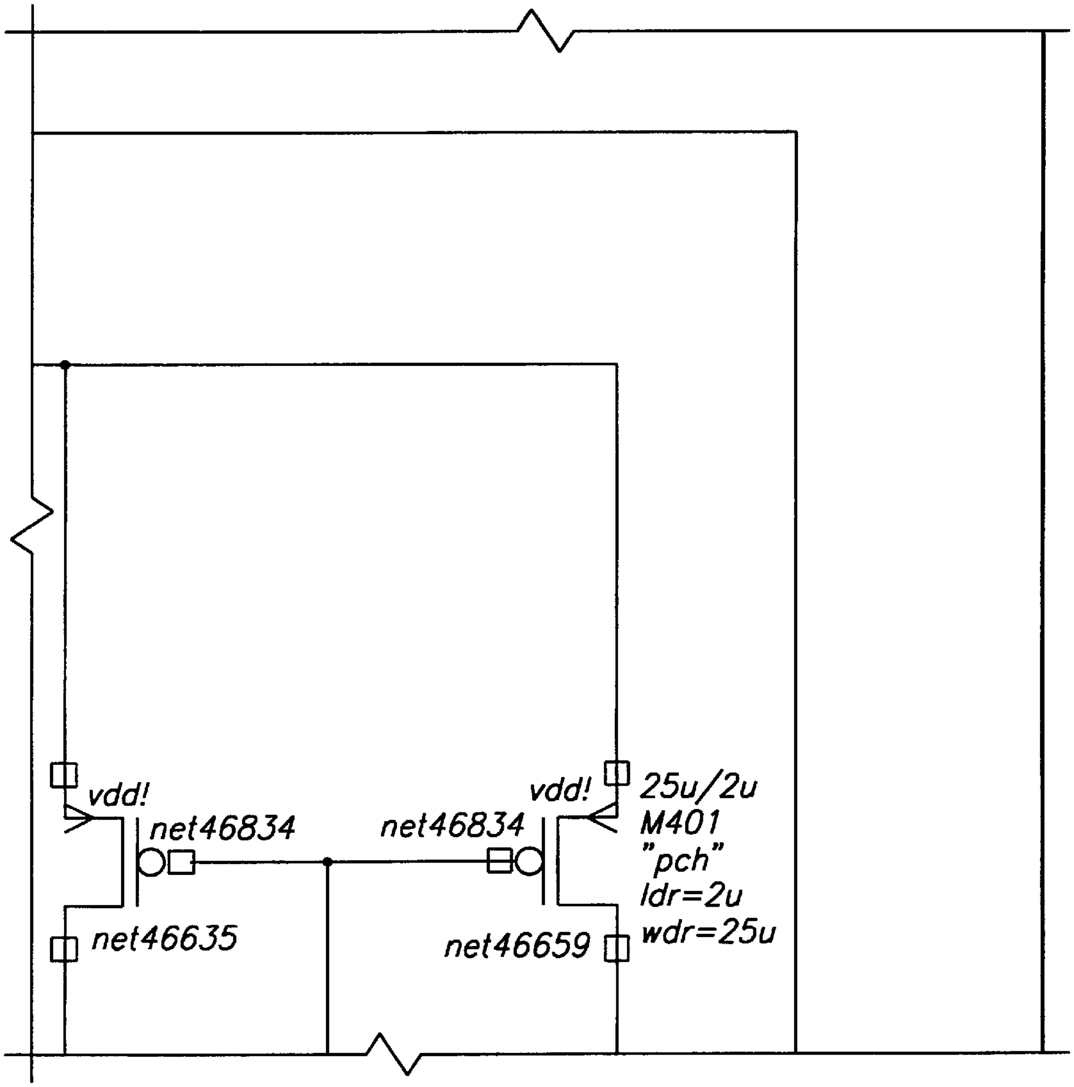
Fig 8.0505BN

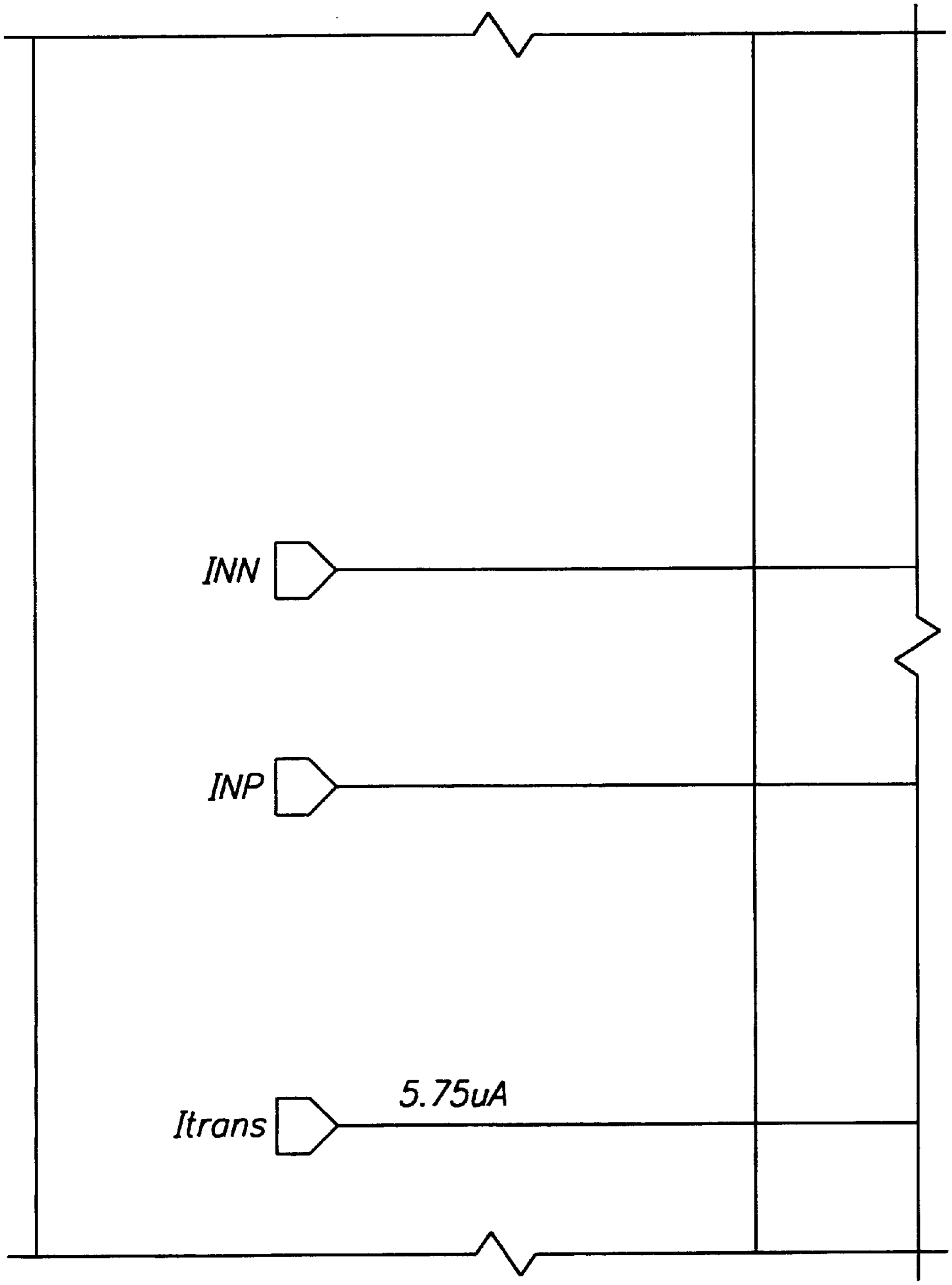
FIG 8.050SCA

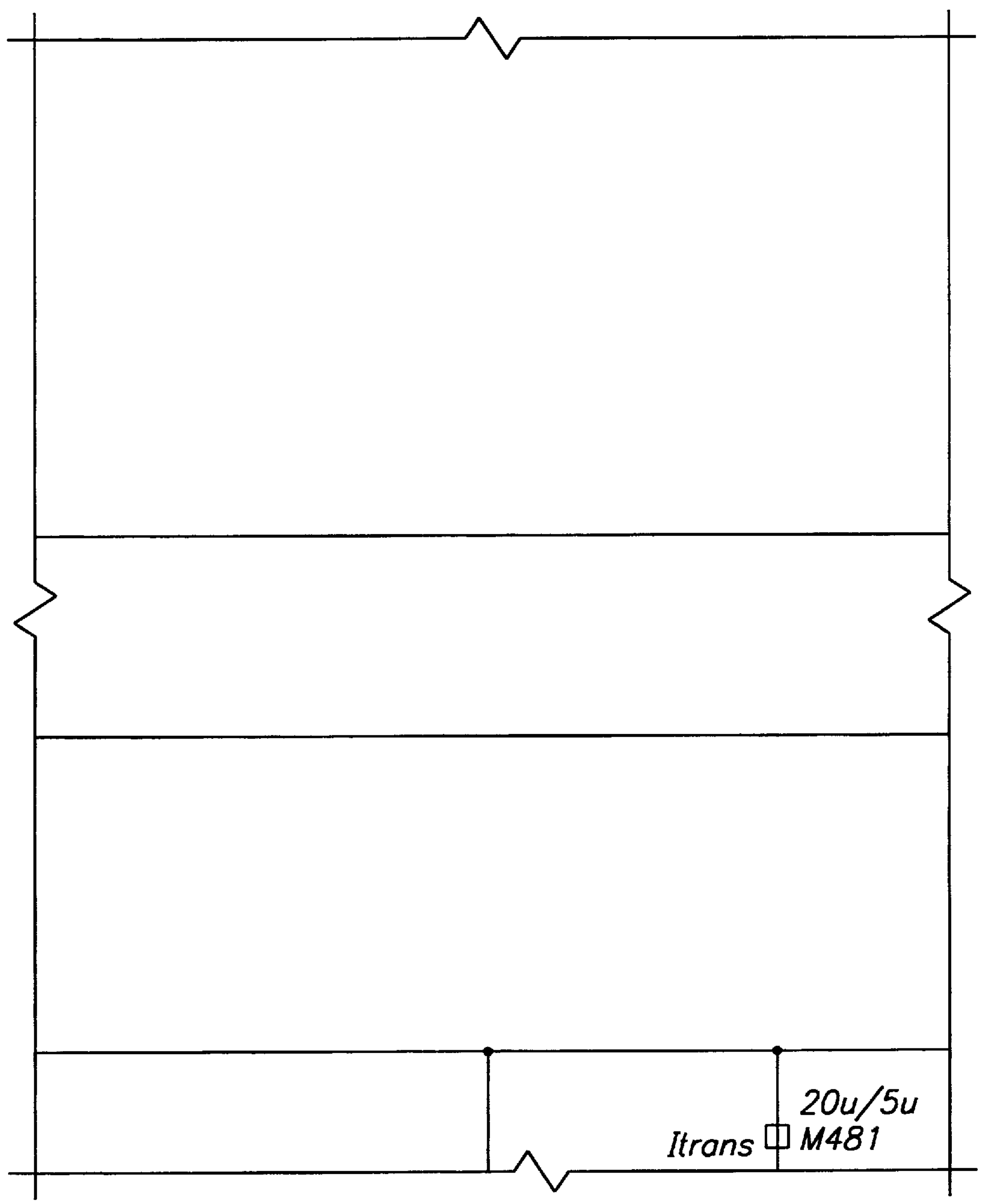
Fig 8.050SCB

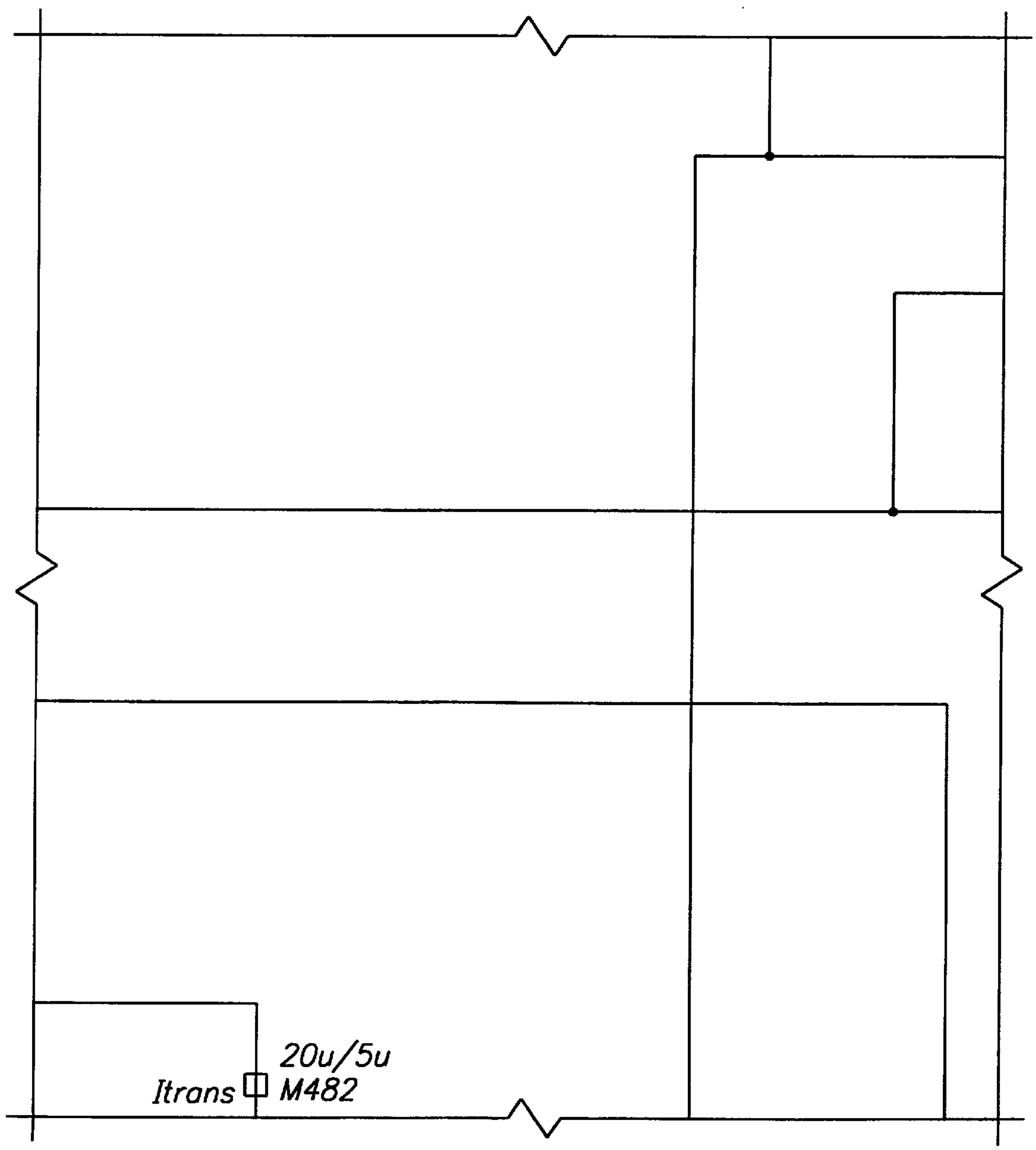
Fig 8.050SCC

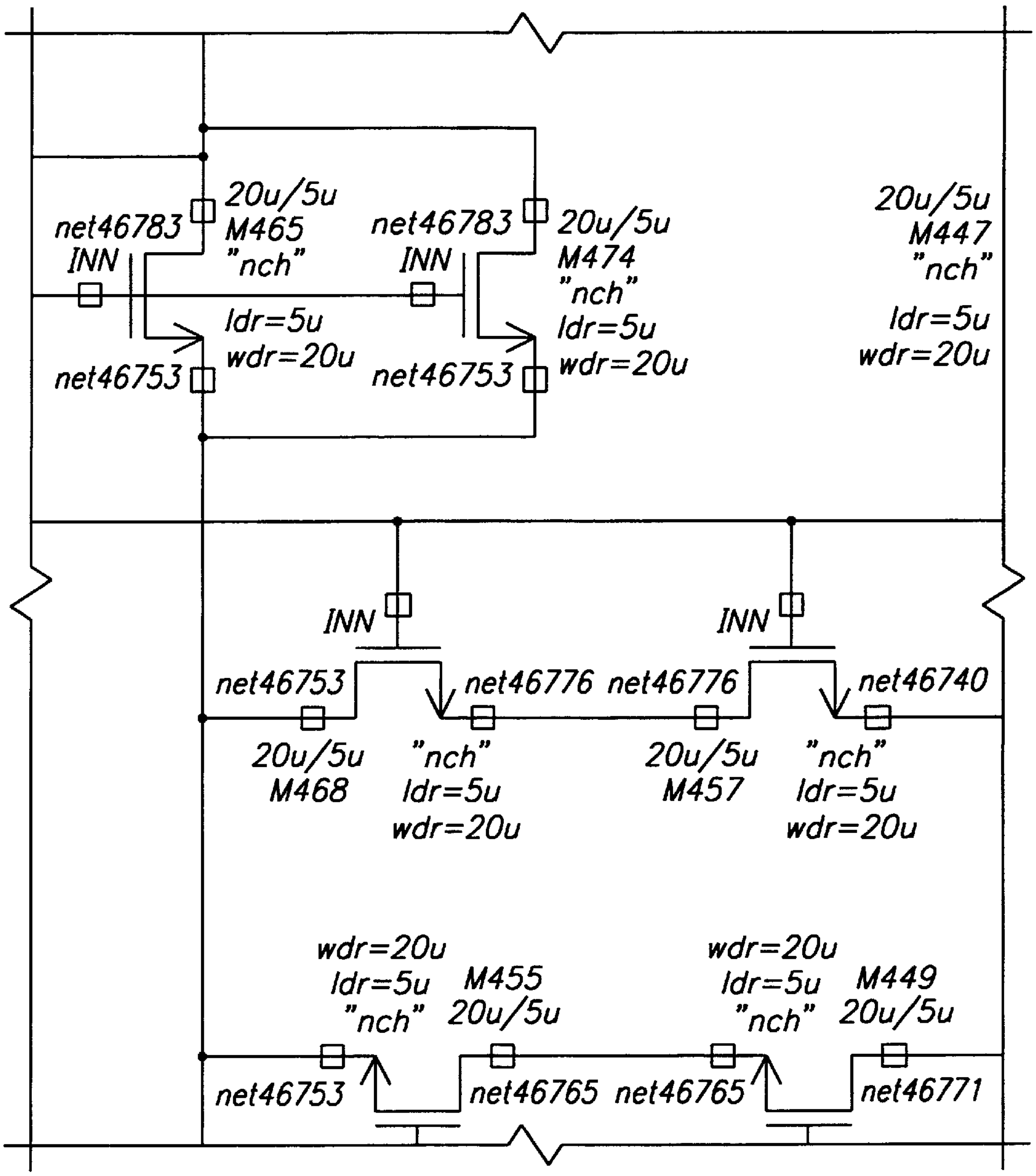
Fig 8.050SCD

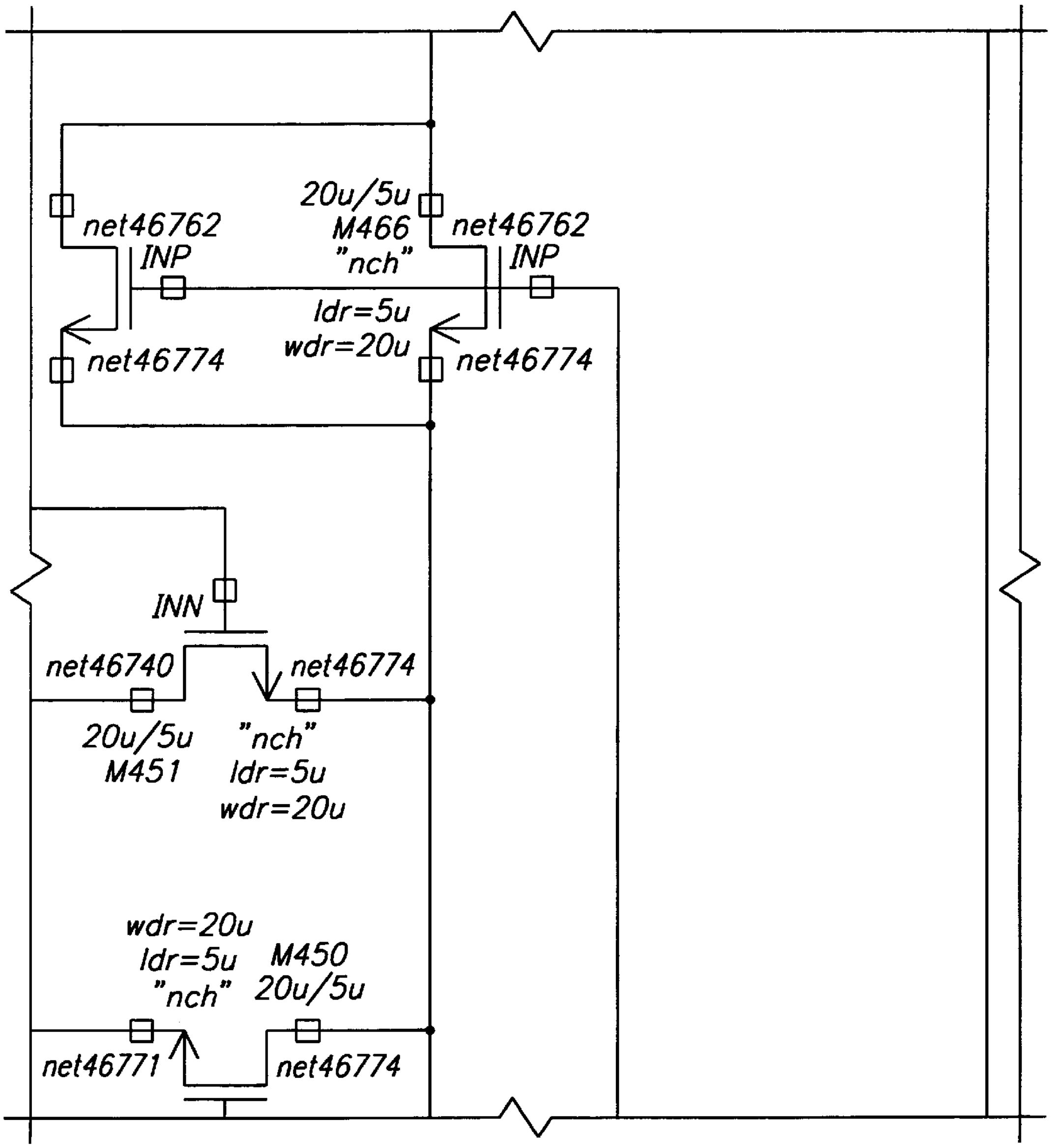
FIG. 8.050SCE

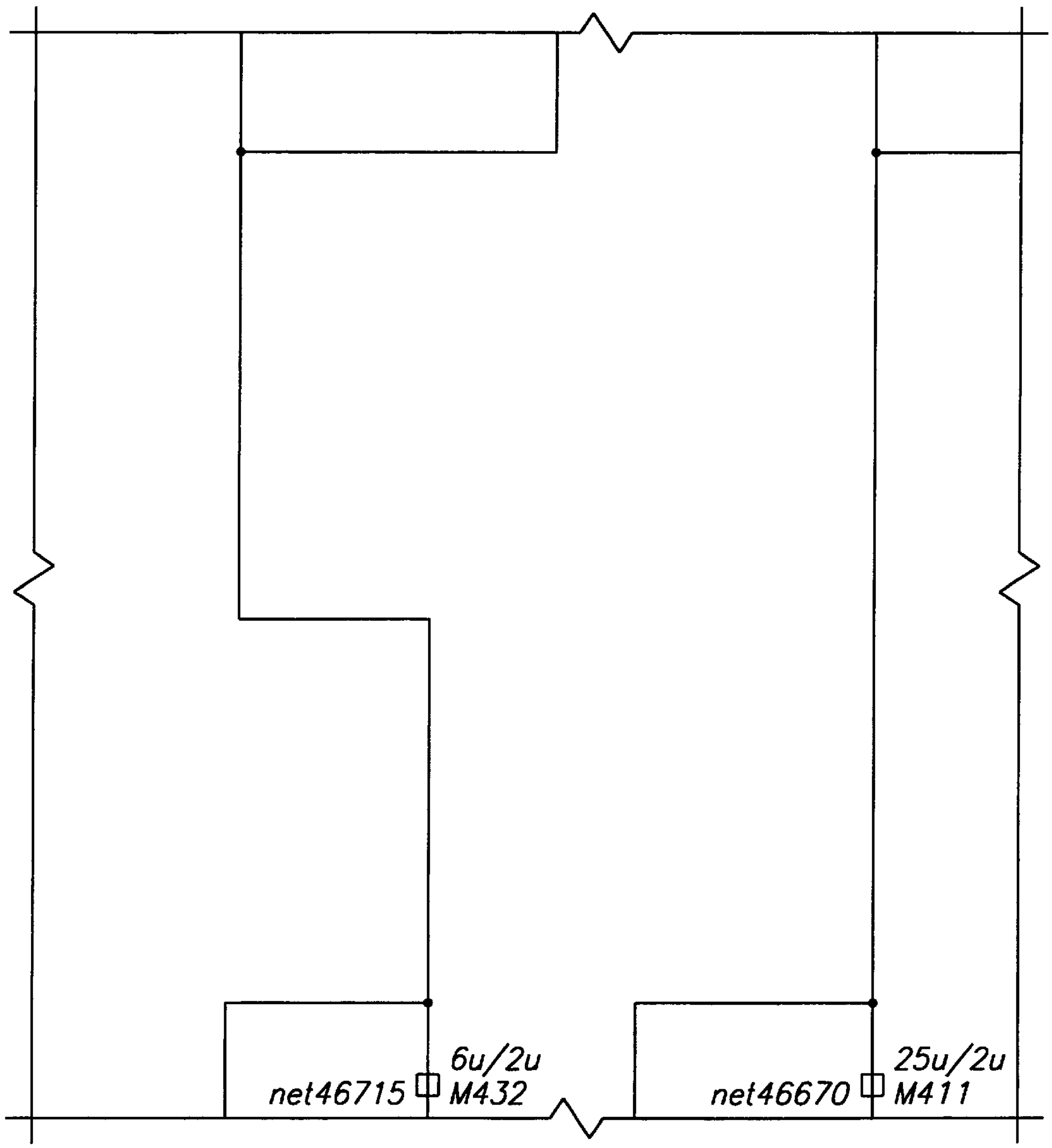
Fig 8.0505CF

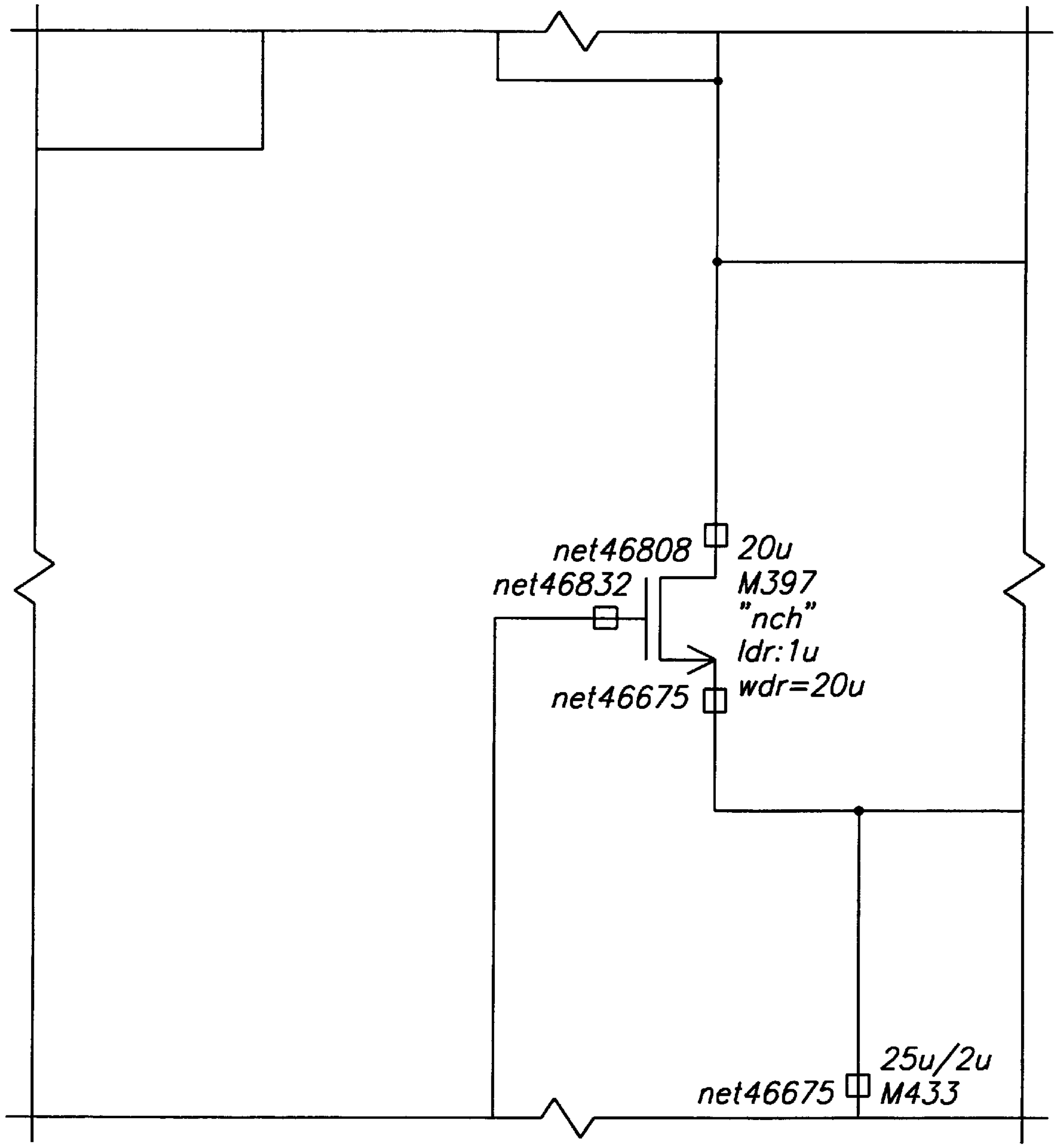
Fig 8.050SCG

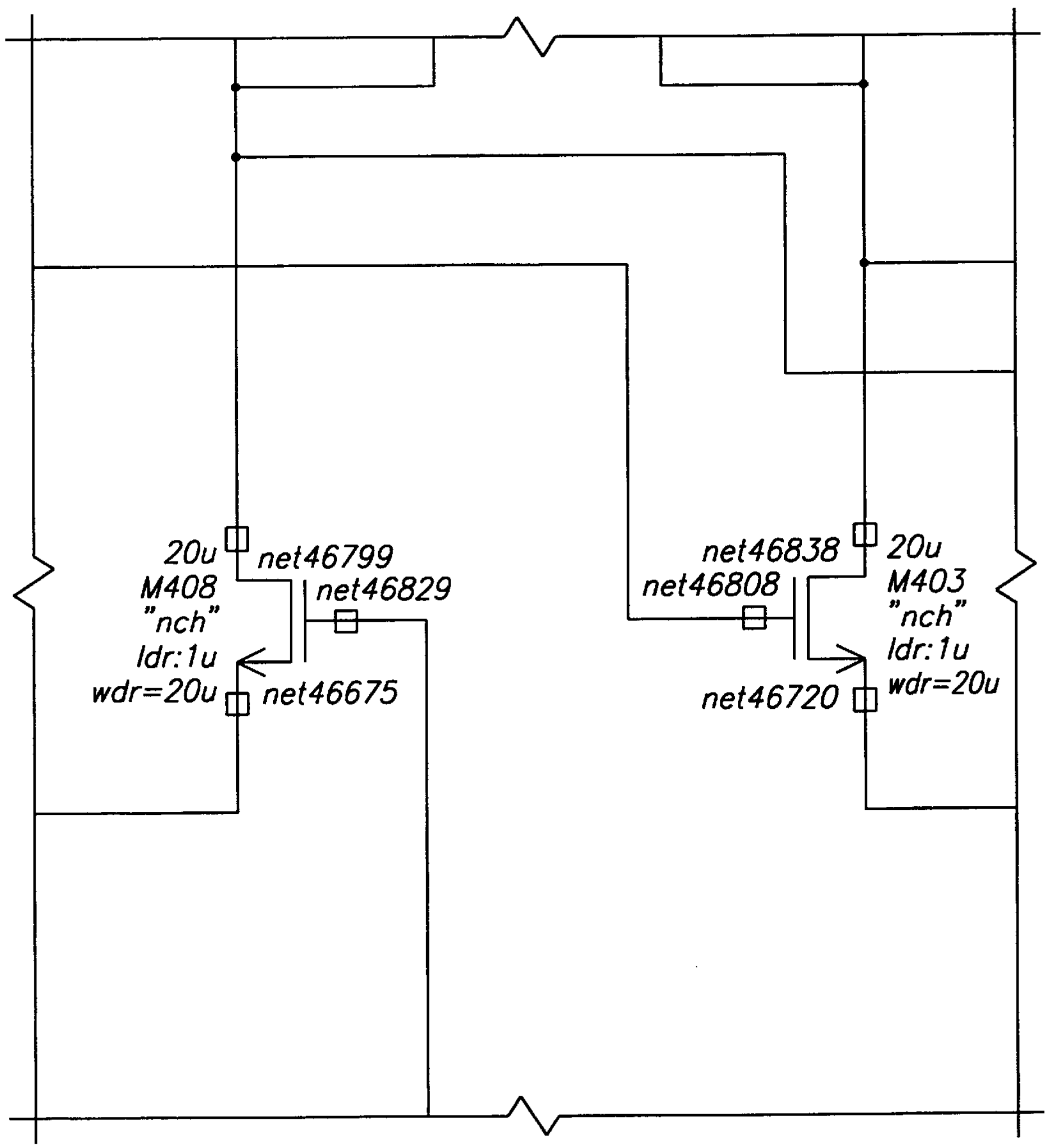
Fig 8.050SCH

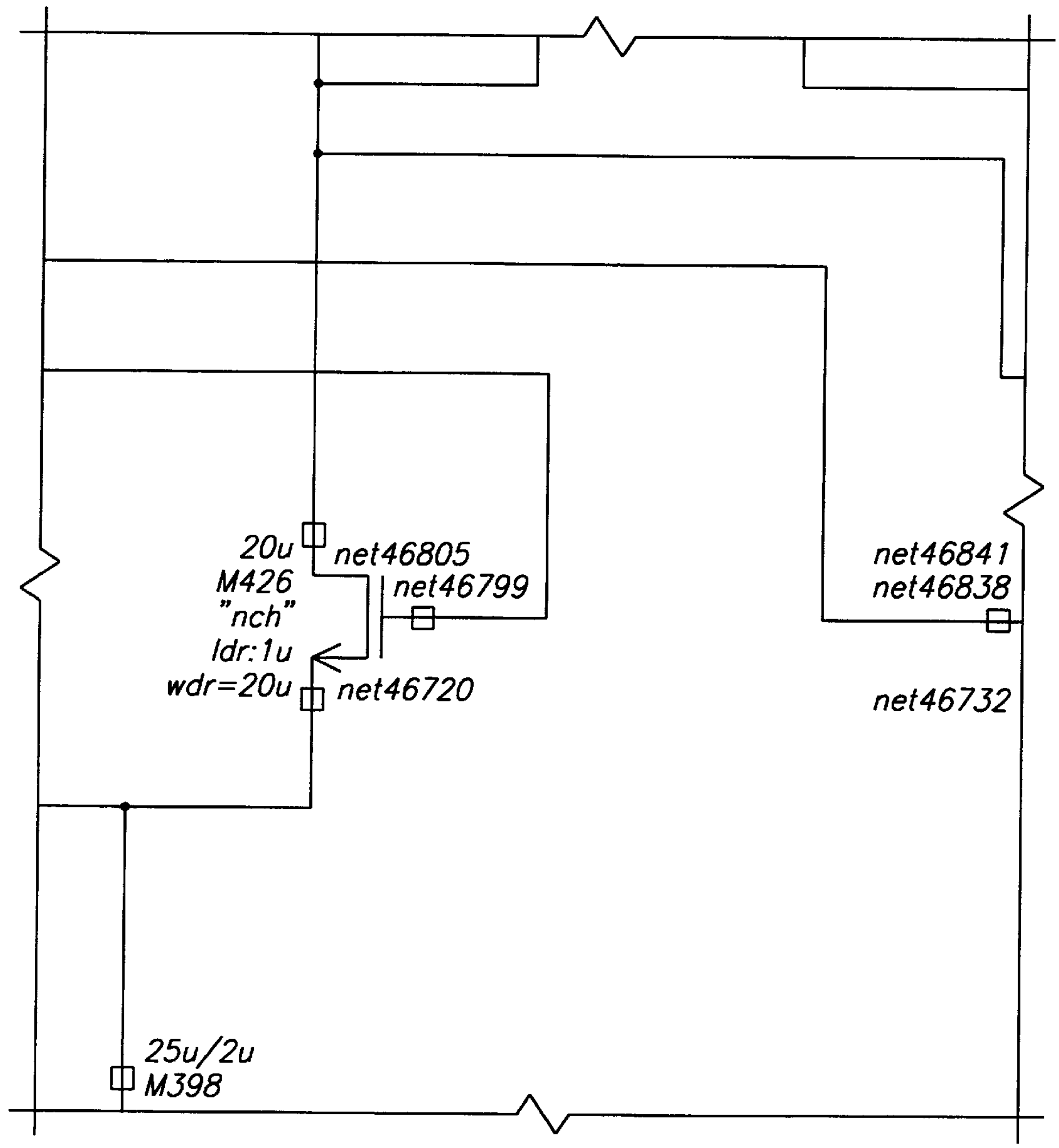
Fig 8.050SCI

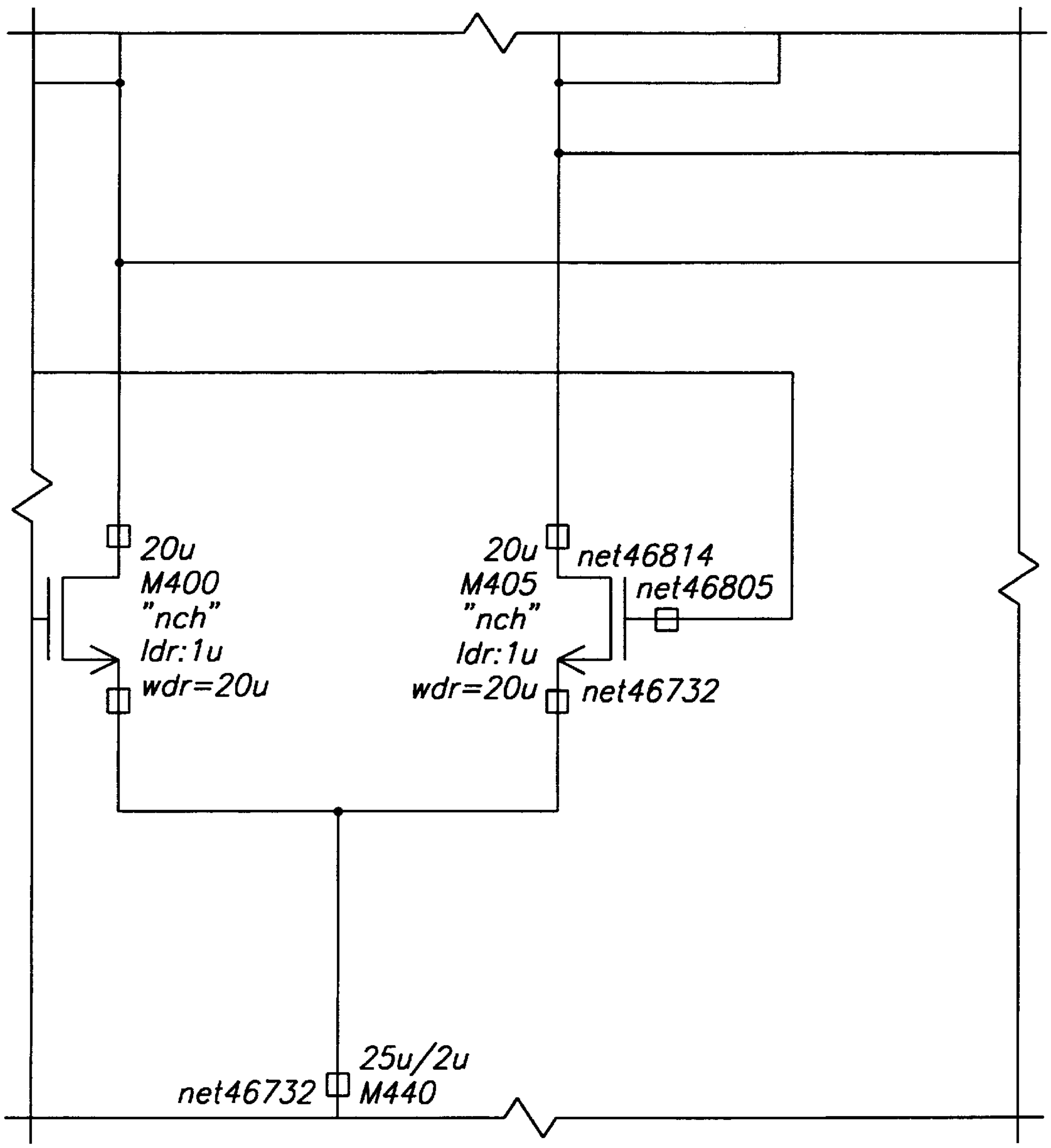
FIG 8.0505CJ

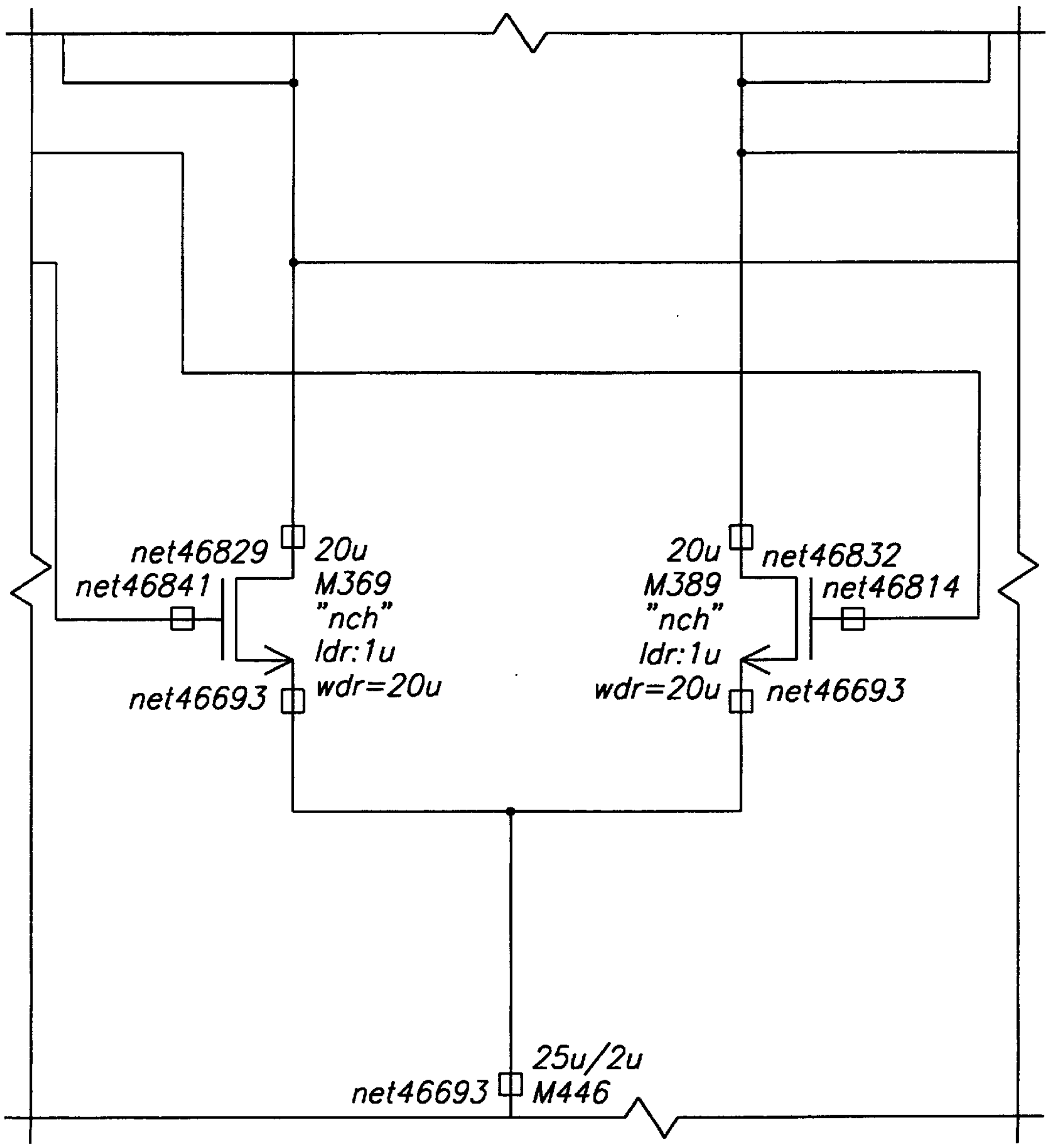
Fig 8.050SCK

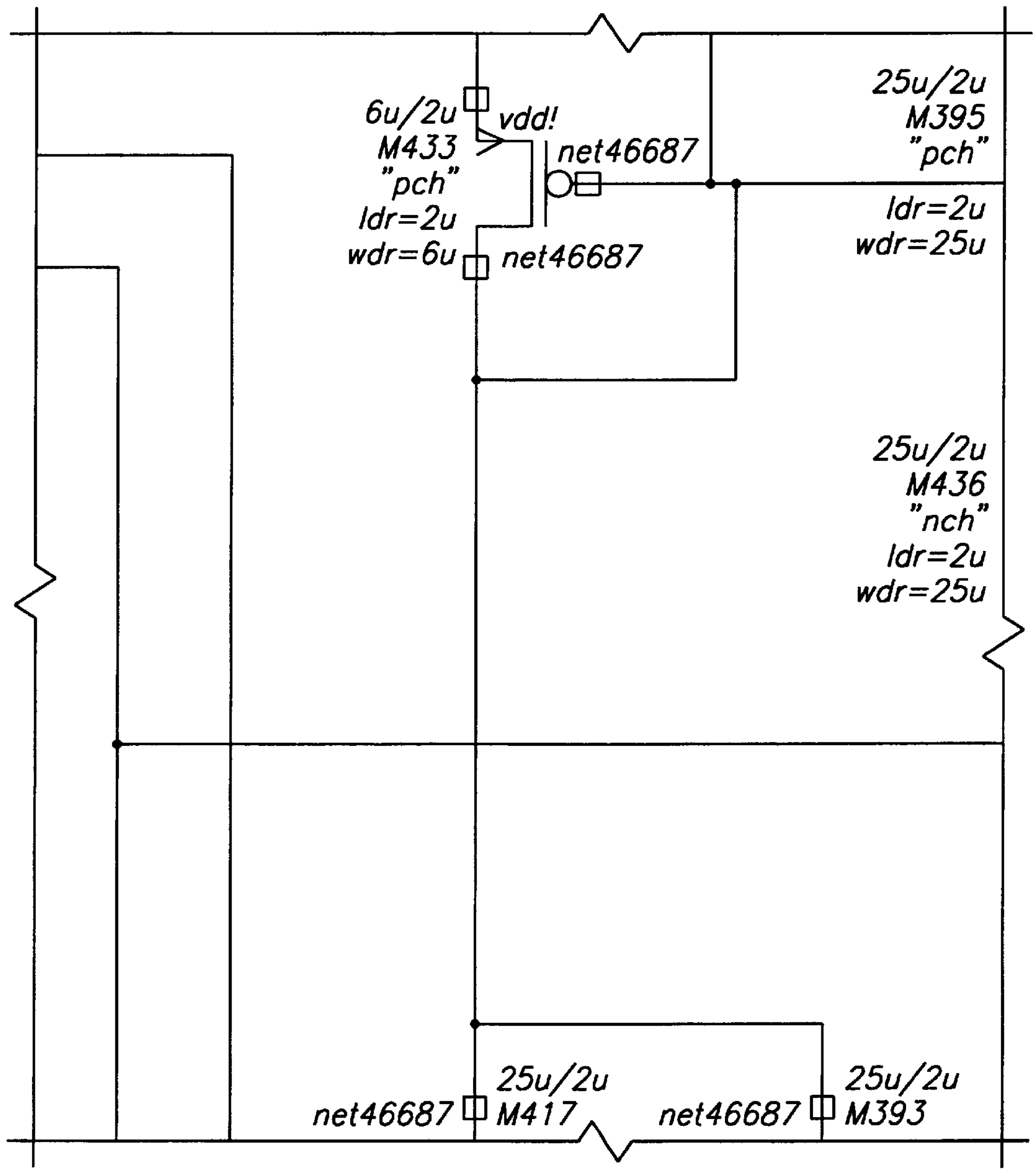
Fig 8.050SCL

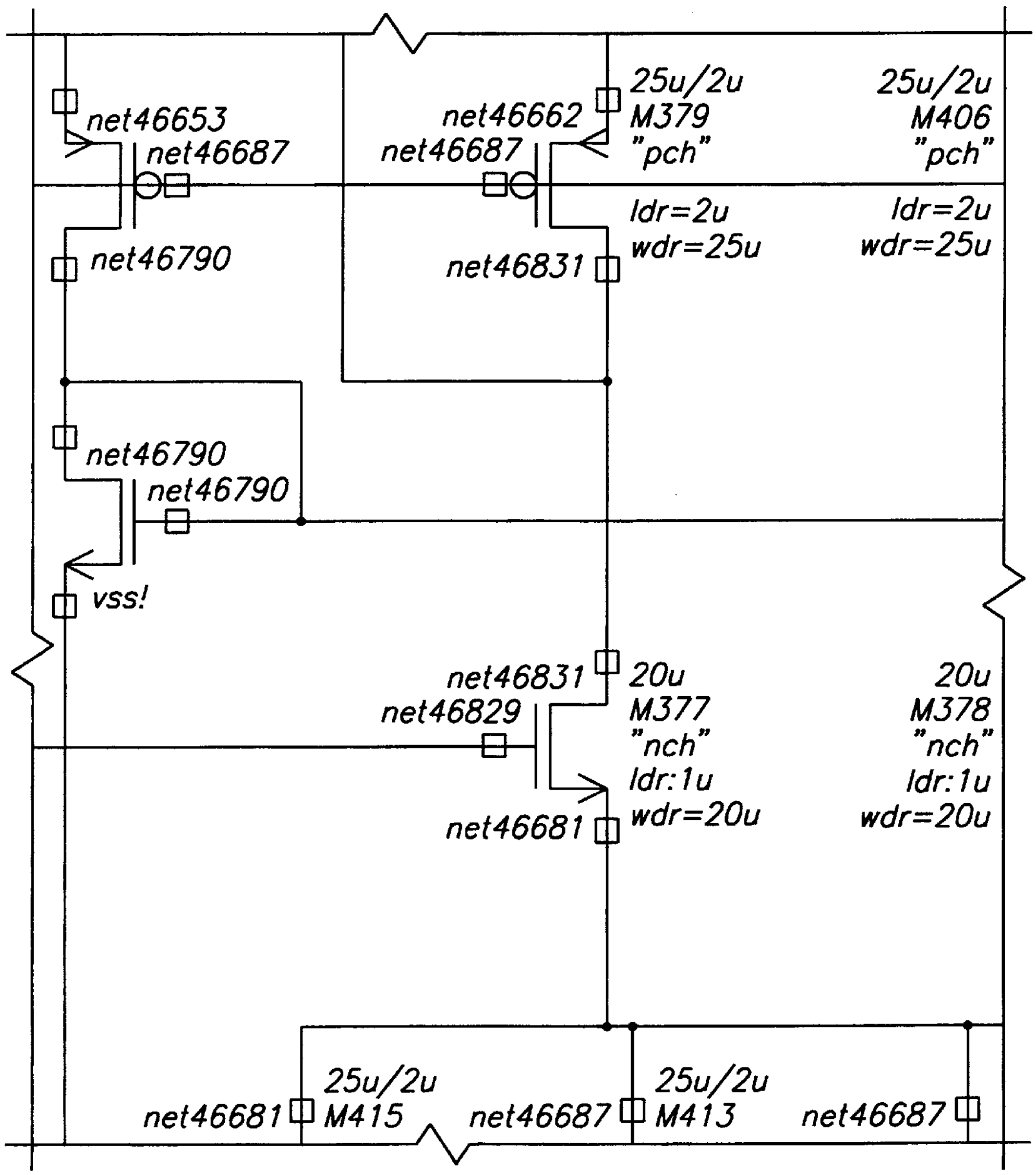
Fig 8.050SCM

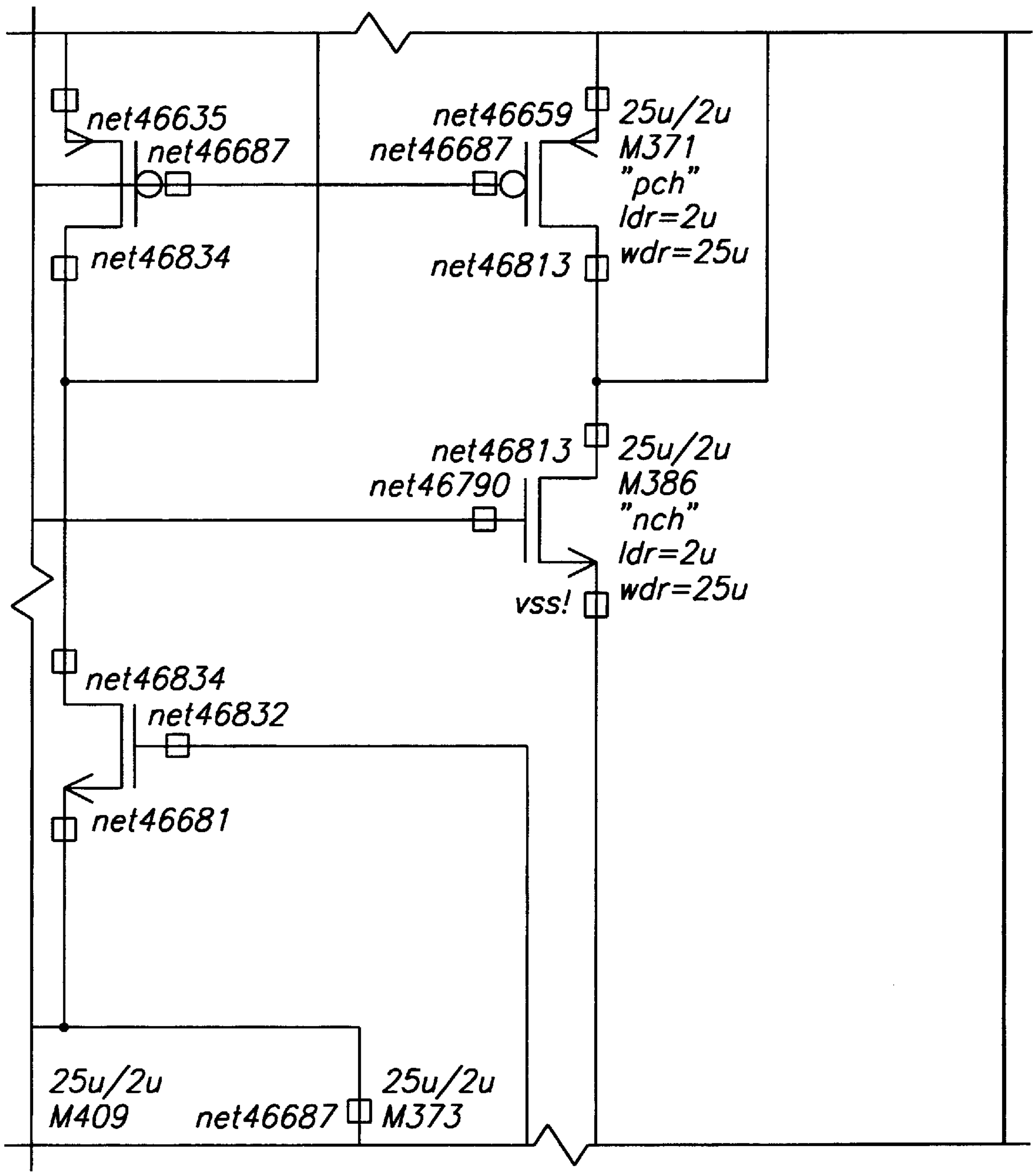
Fig 8.05O5CN

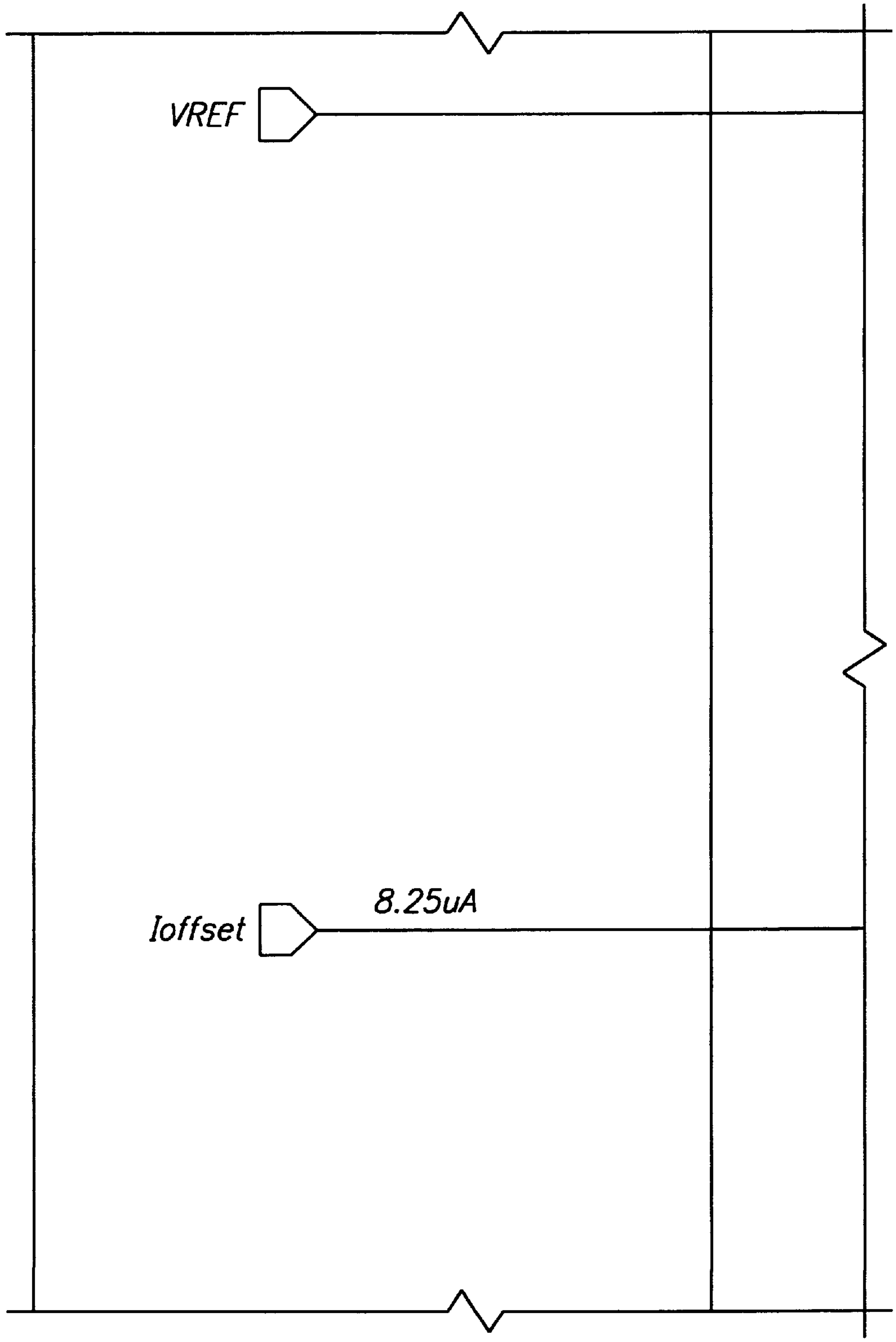
Fig 8.0505DA

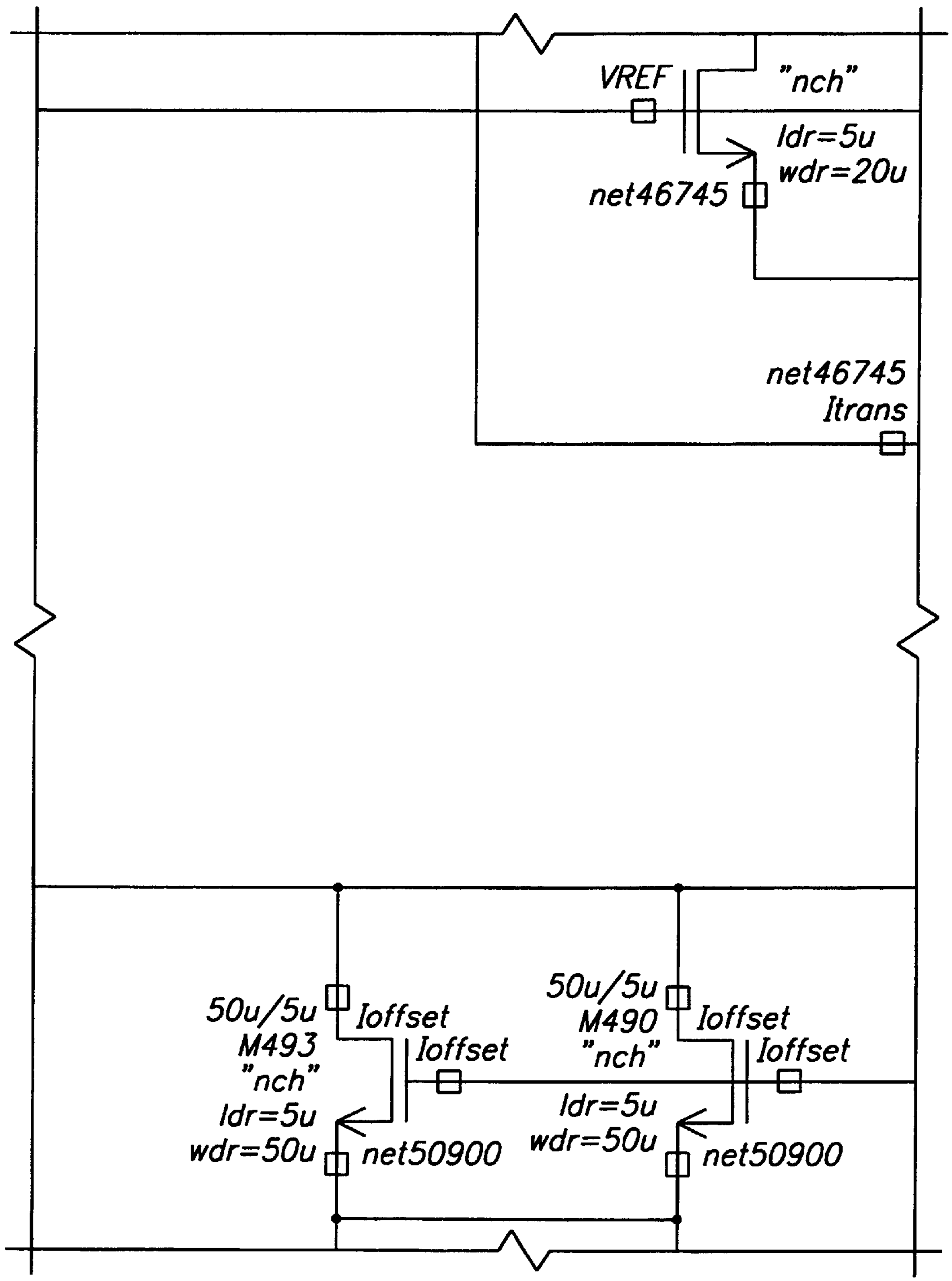
Fig 8.0505DB

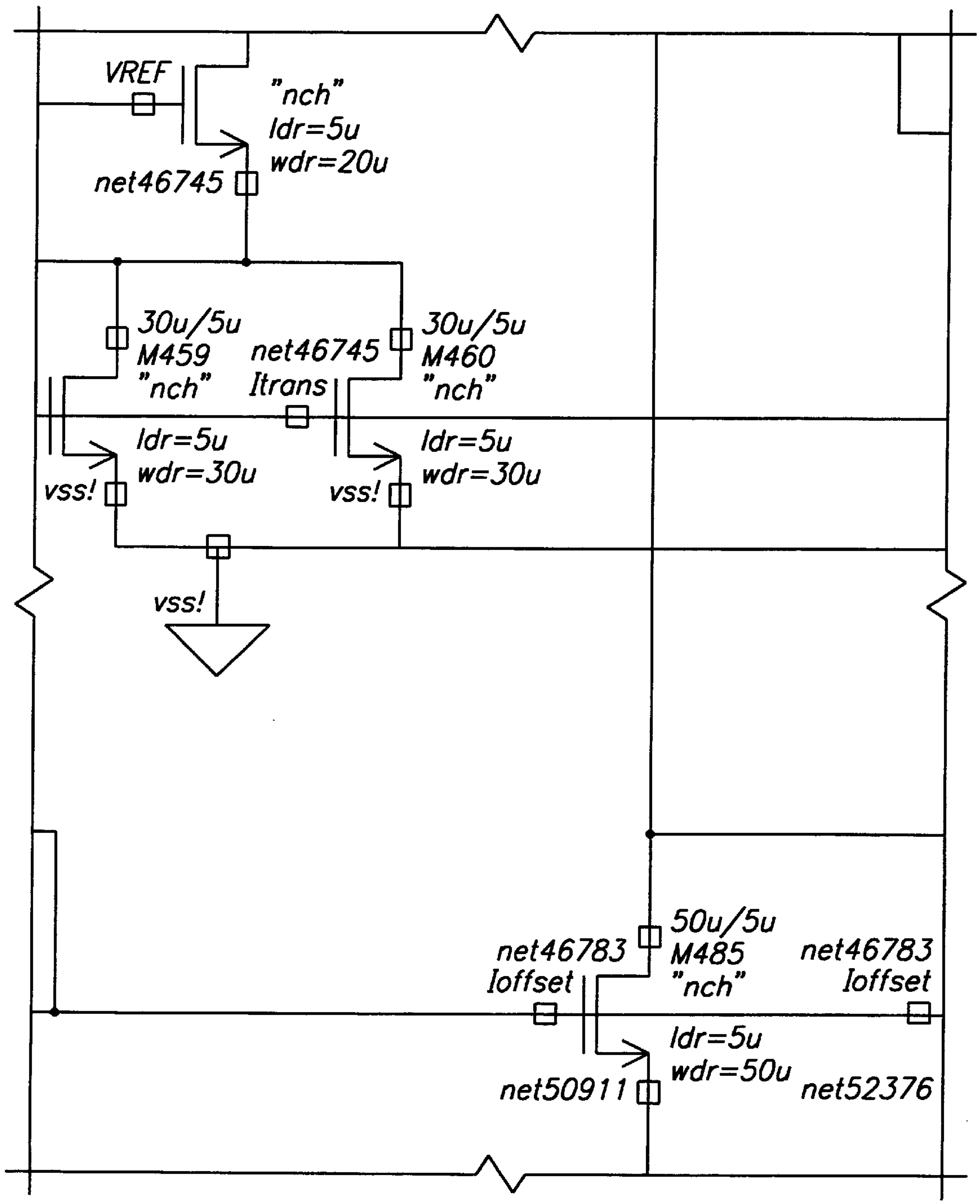
Fig 8.0505DC

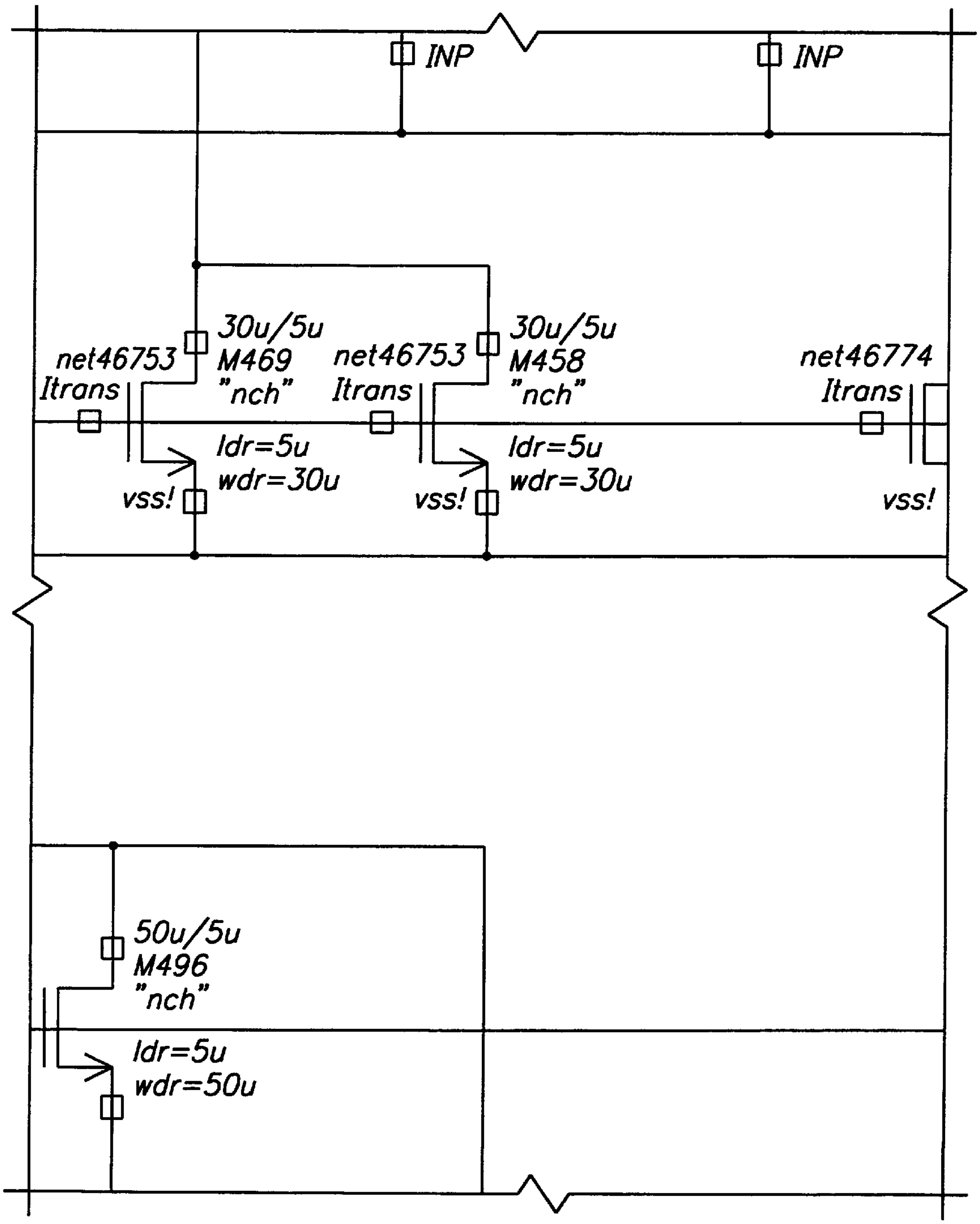
Fig 8.050SDD

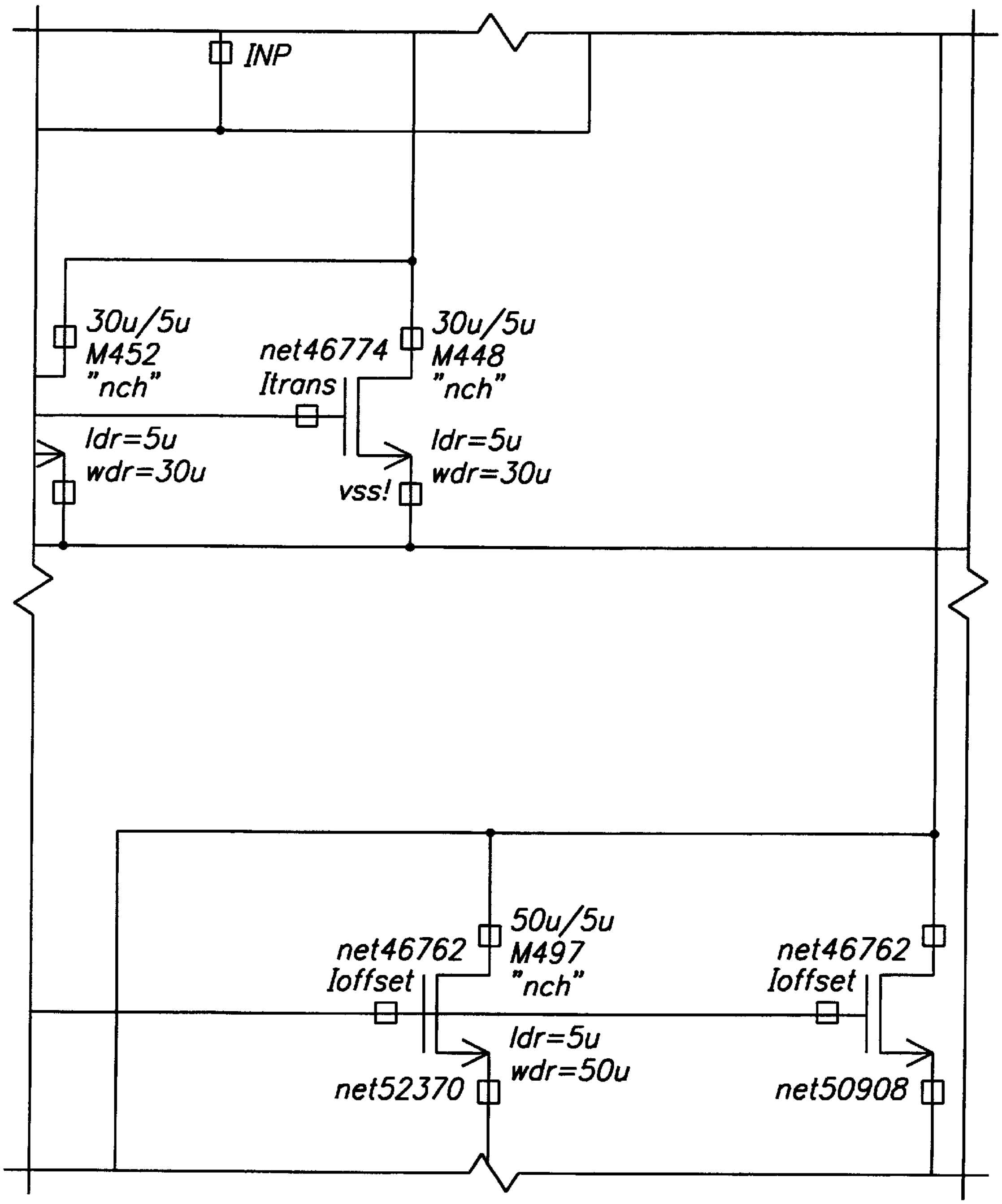
Fig 8.050SDE

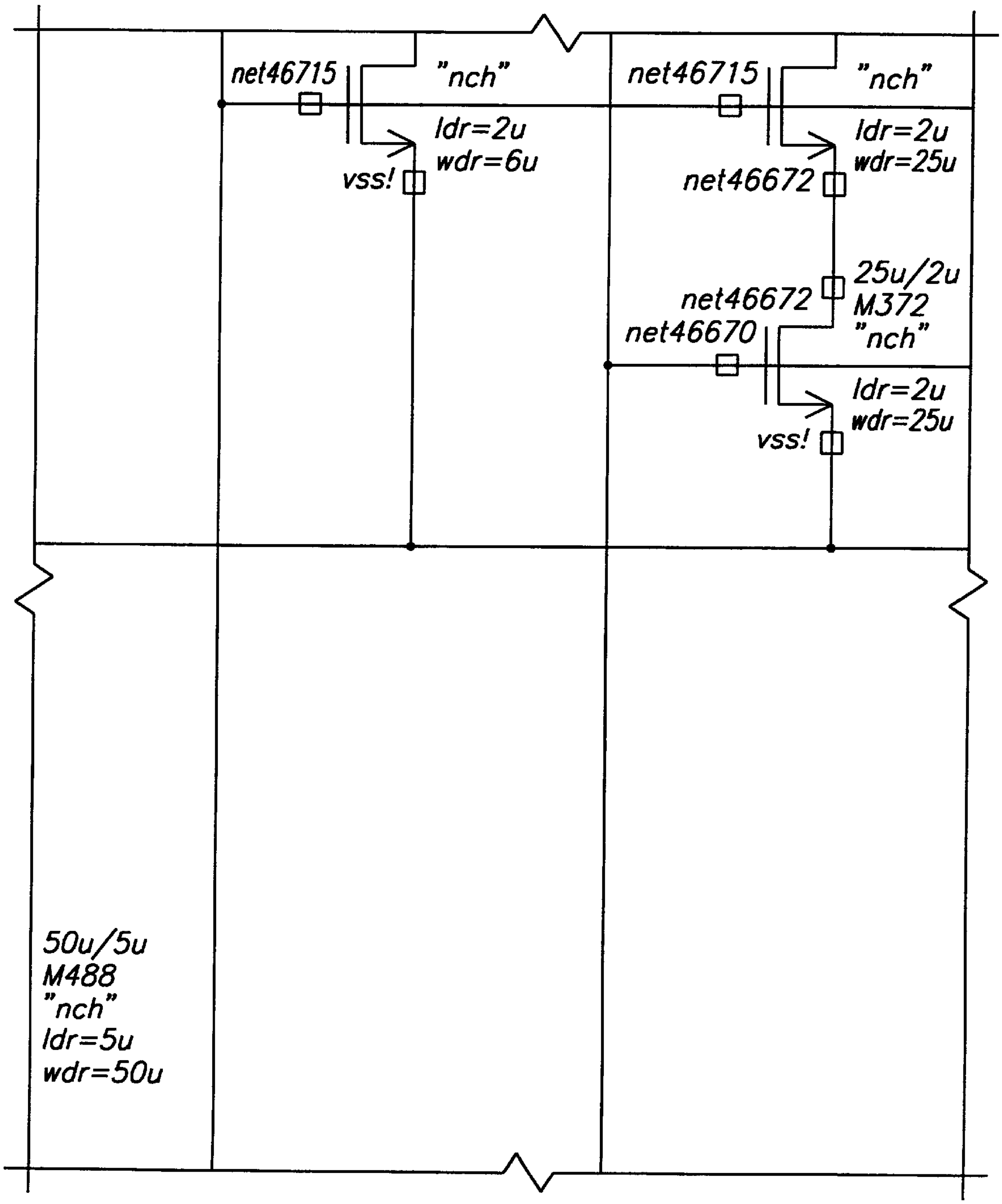
Fig 8.050SDF

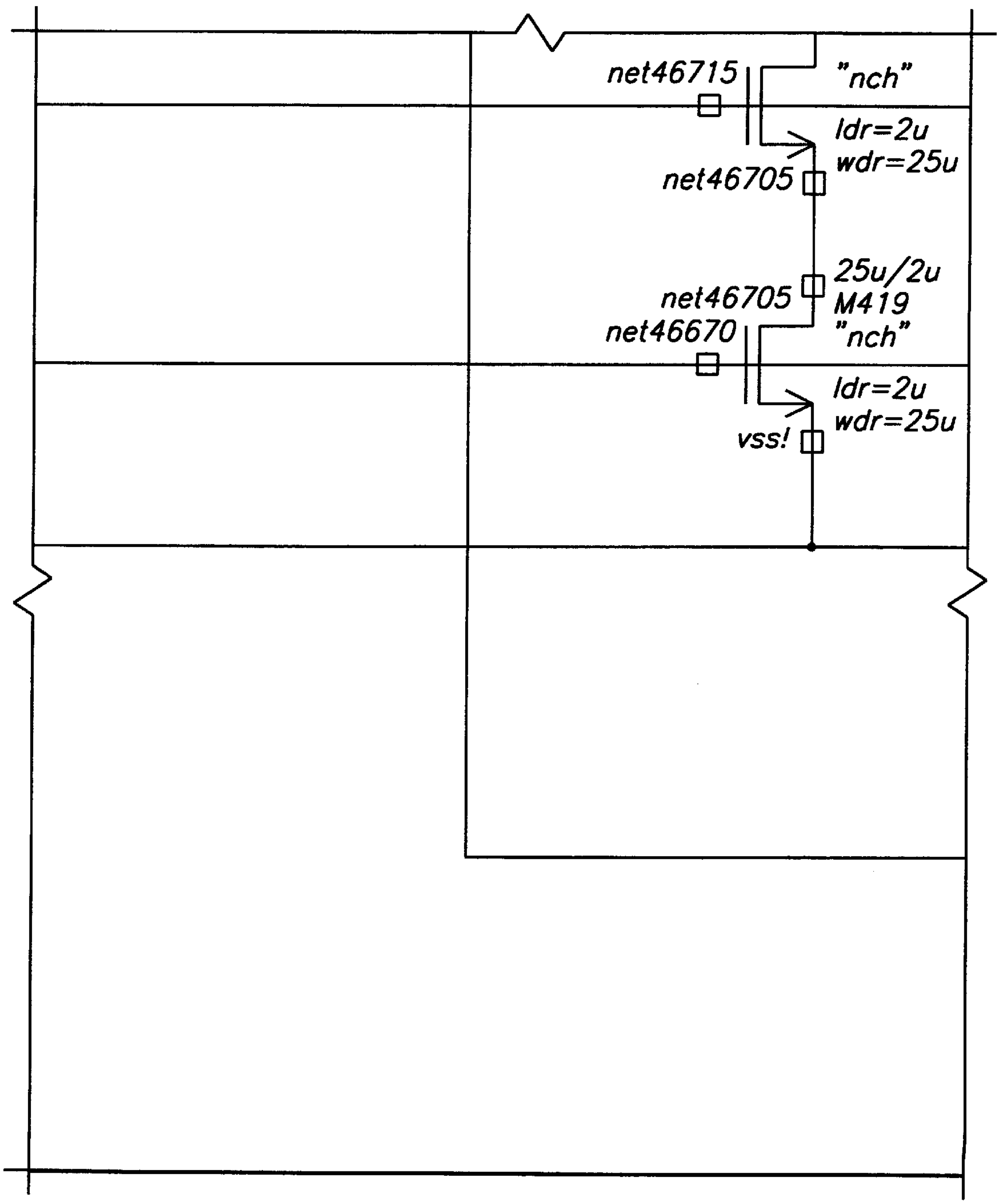
Fig 8.0505DG

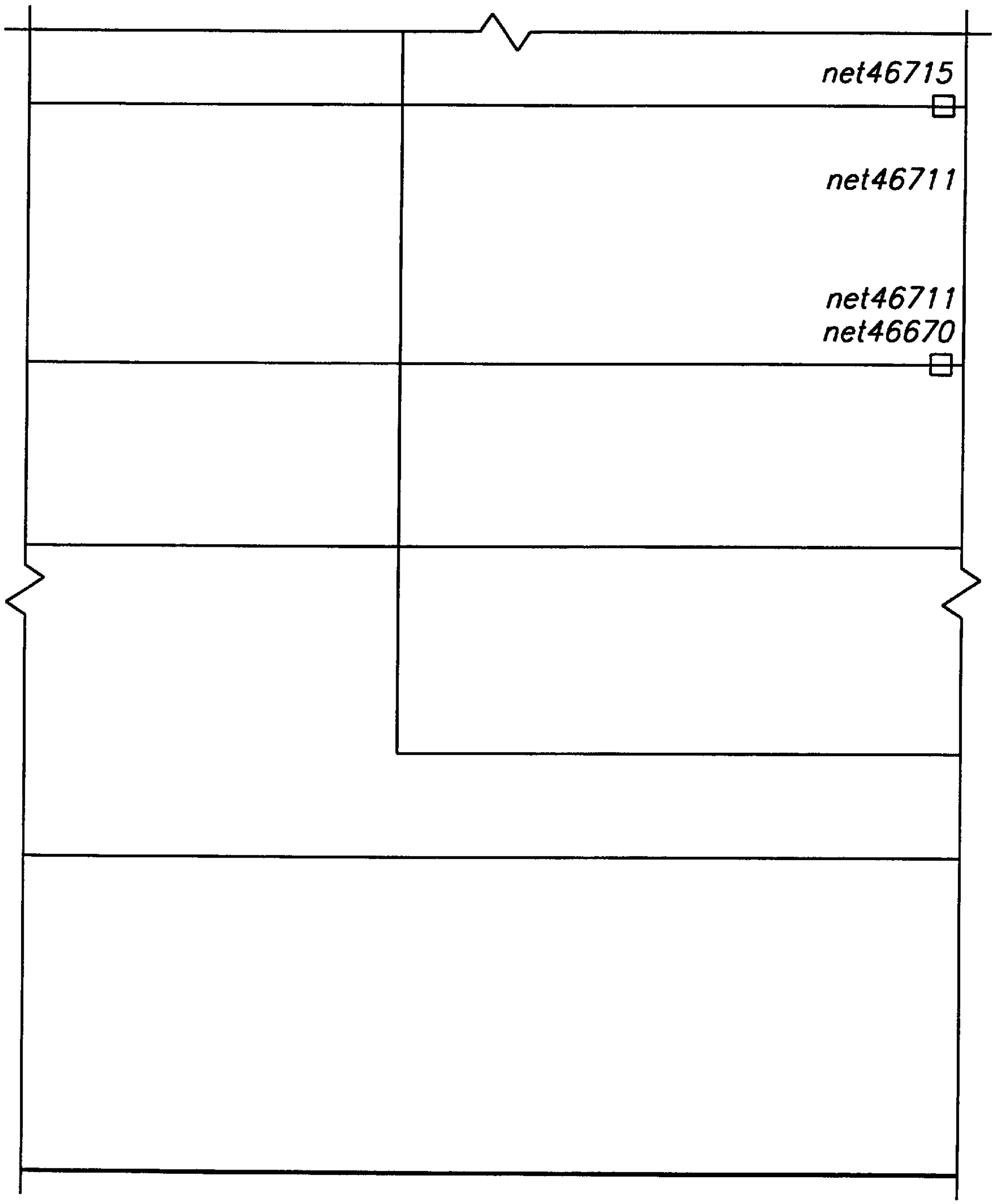
Fig 8.050SDH

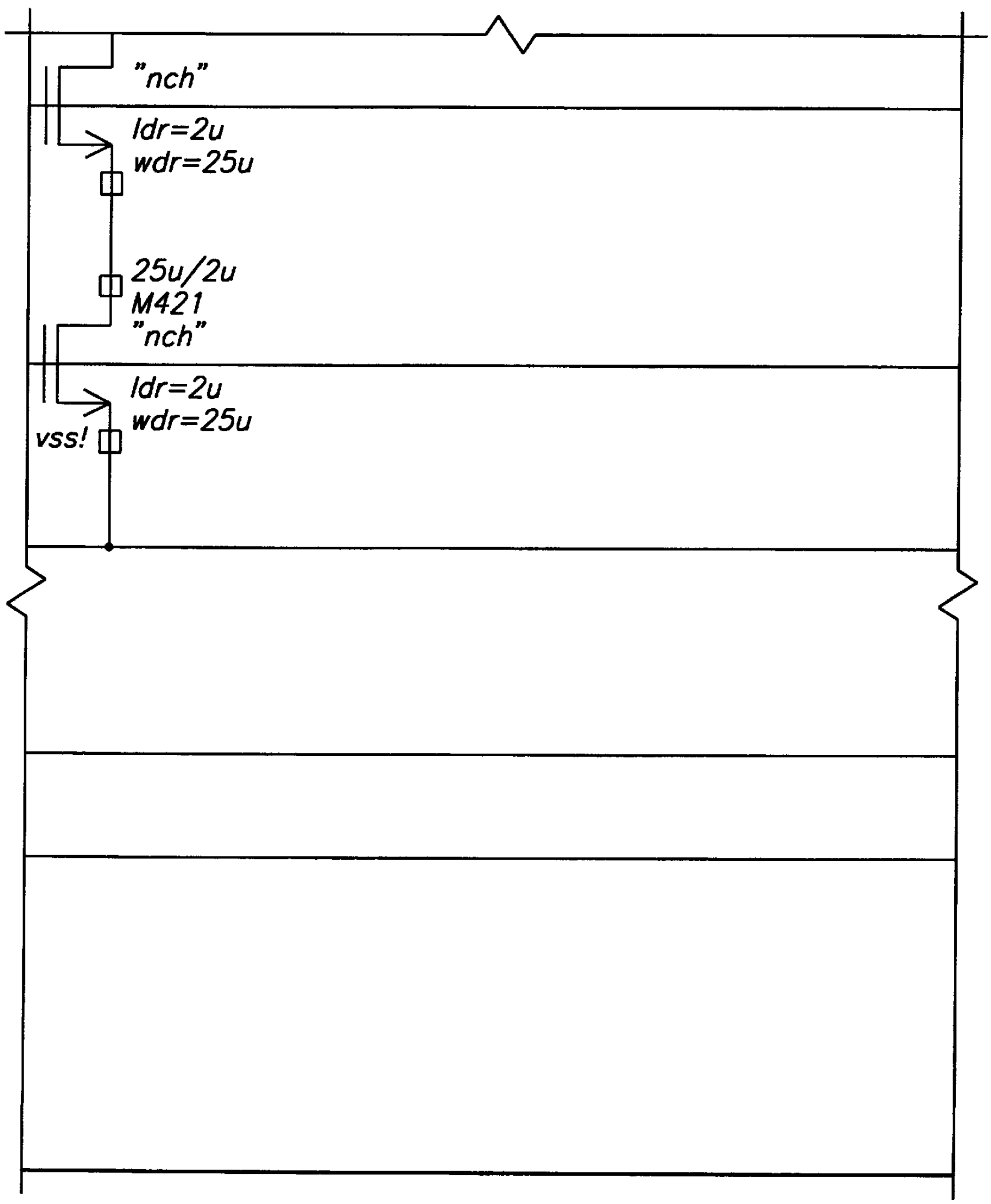
FIG 8.0505DI

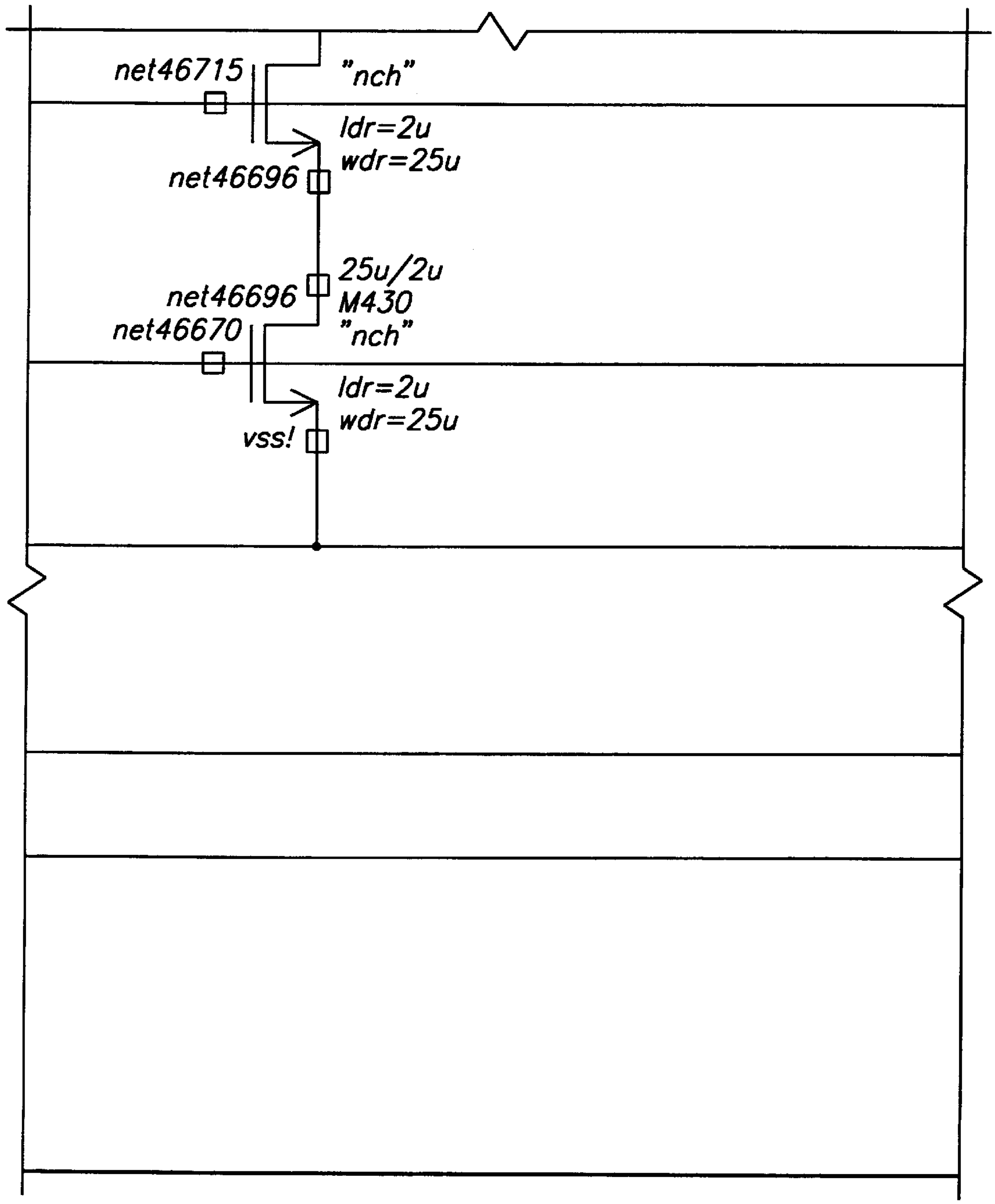
Fig 8.050SD.J

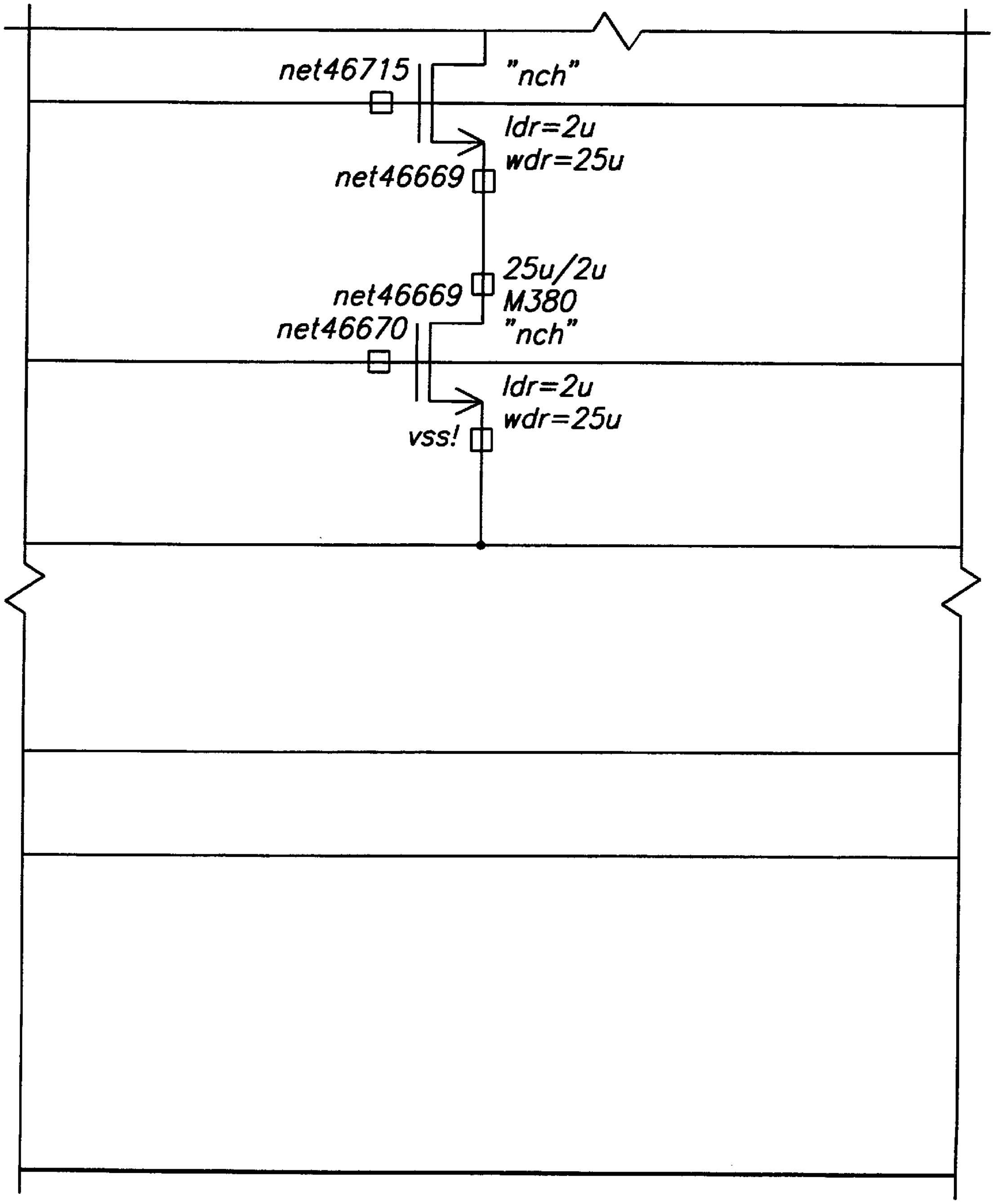
Fig 8.050SDK

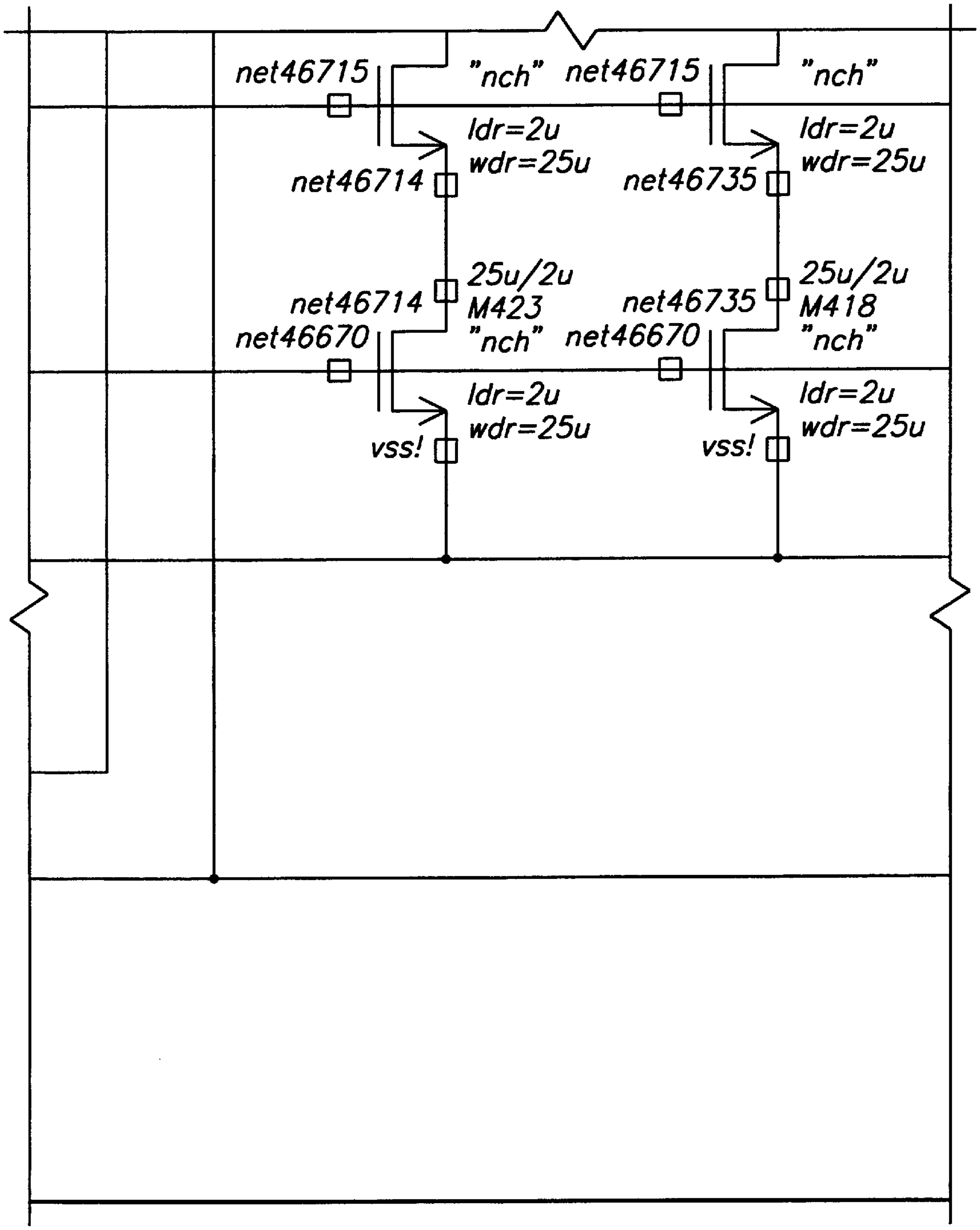
Fig 8.050SDL

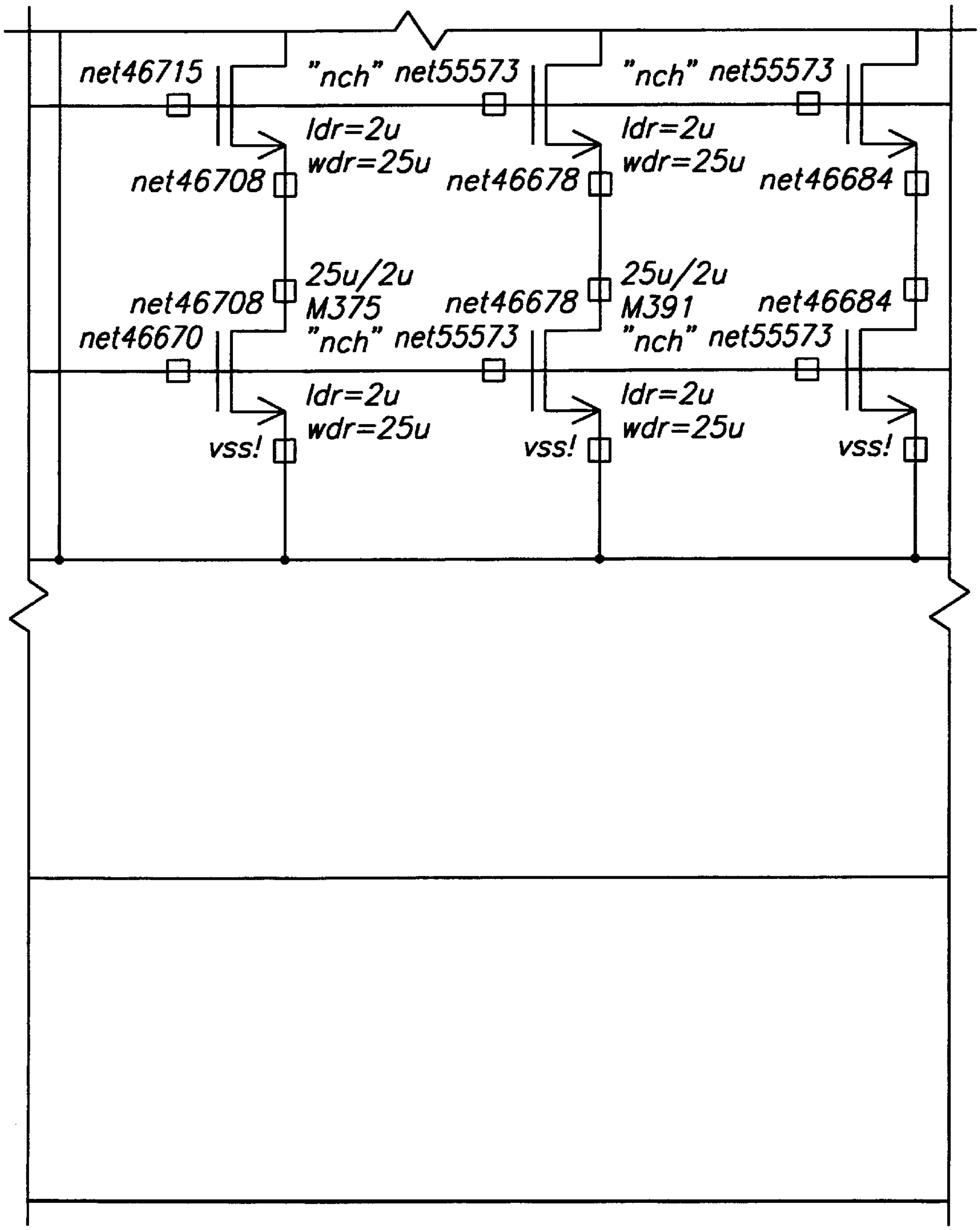
Fig 8.0505DM

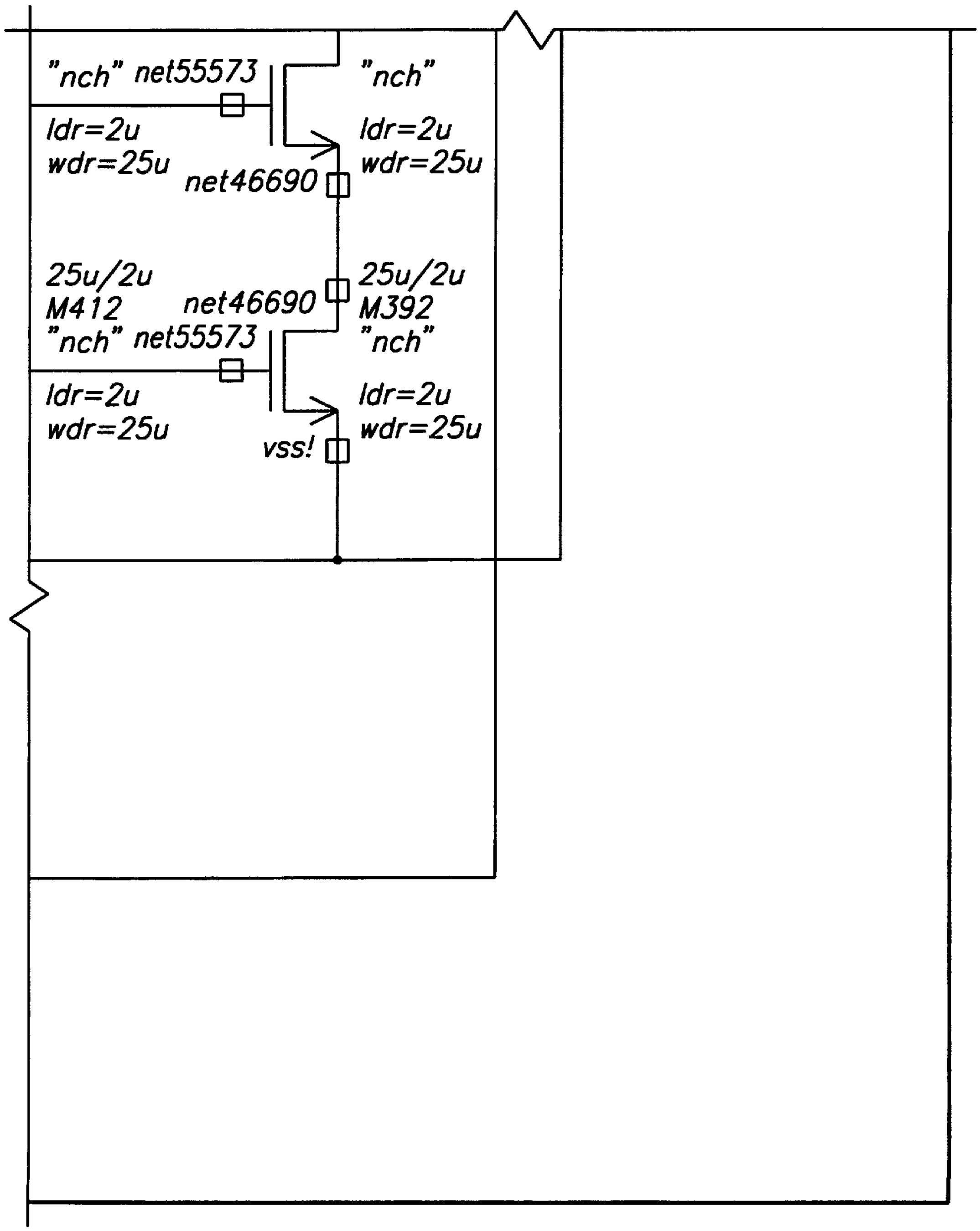
Fig 8.050SDN

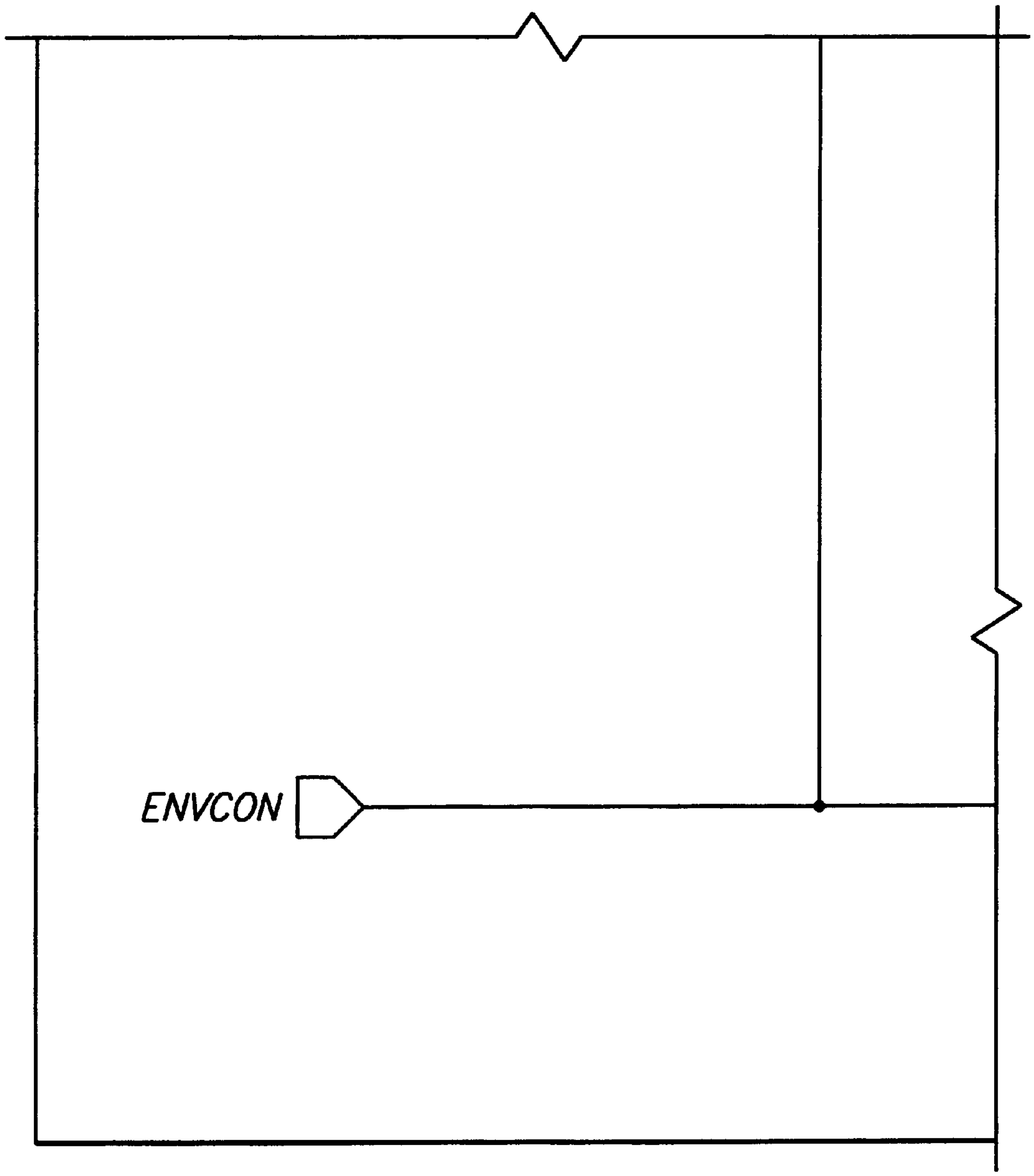
Fig 8.0505EA

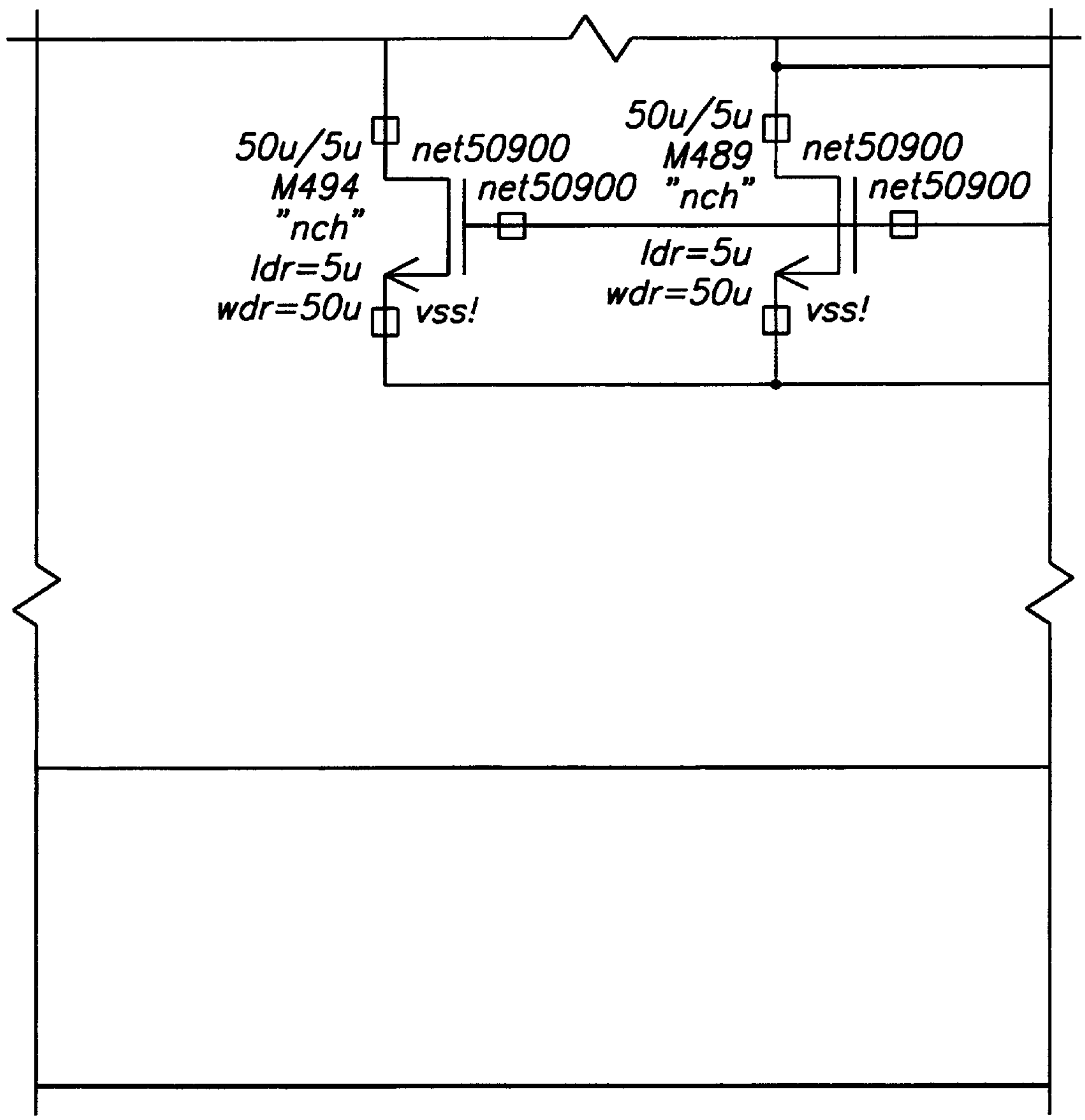
Fig 8.0505EB

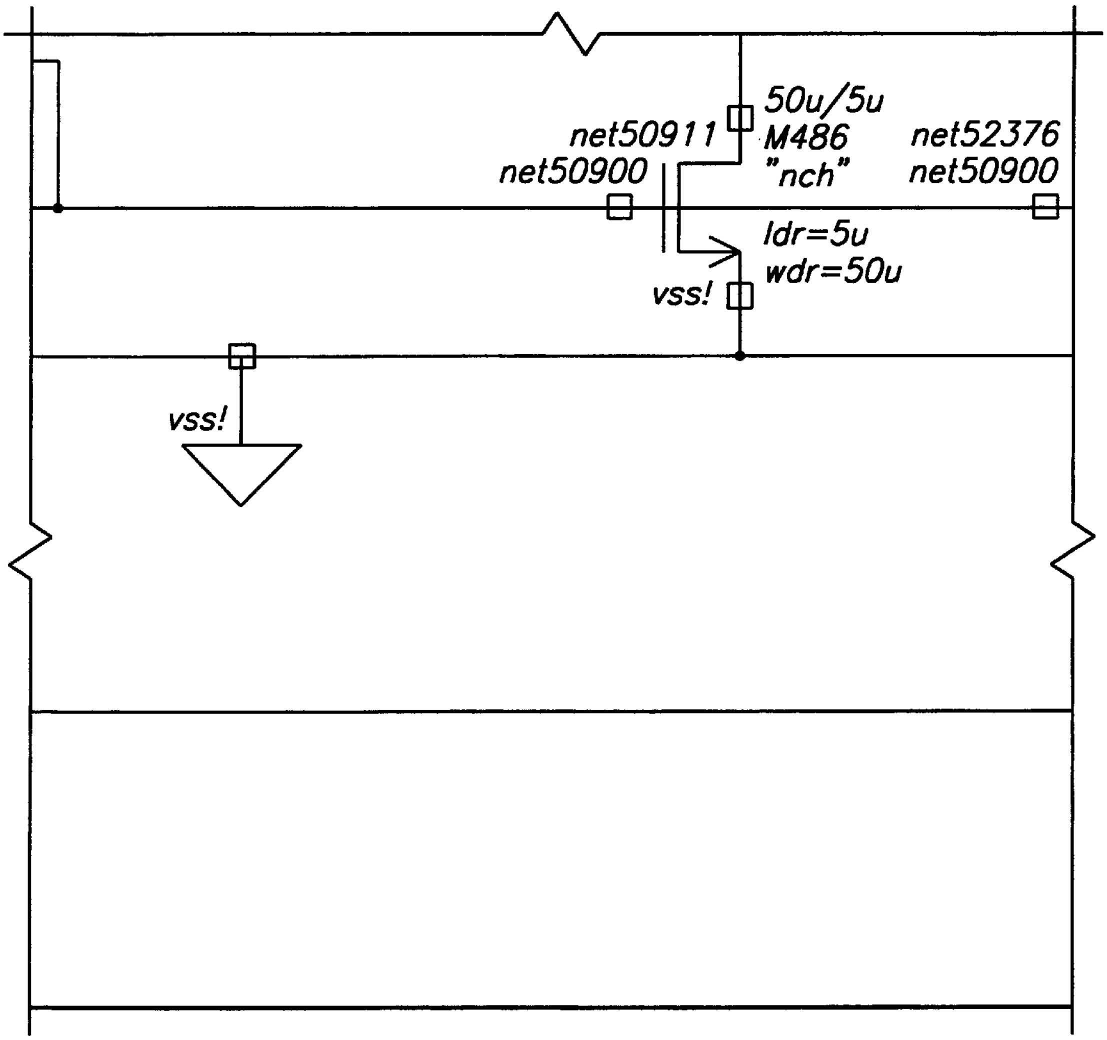
FIG 8.050SEC

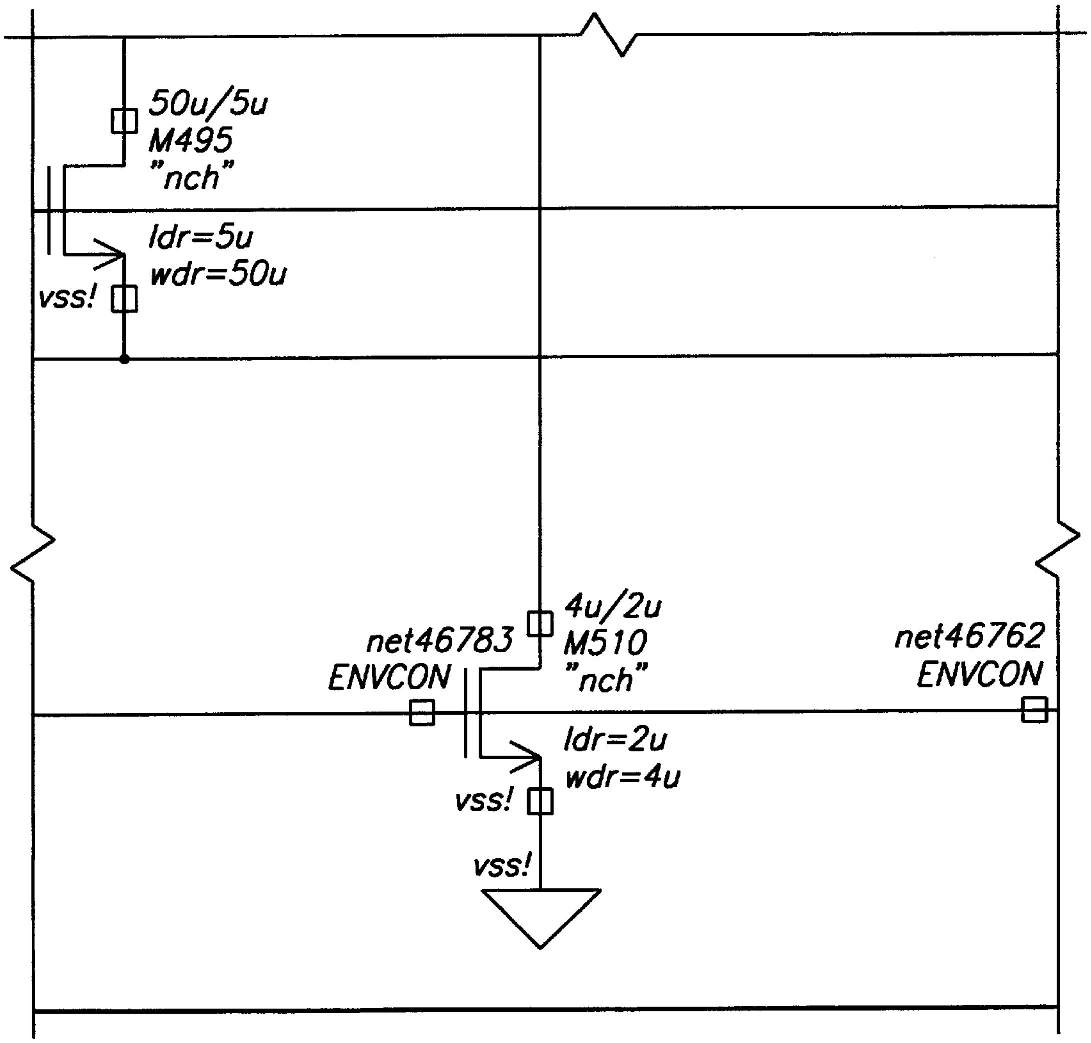
FIG. 8.050SED

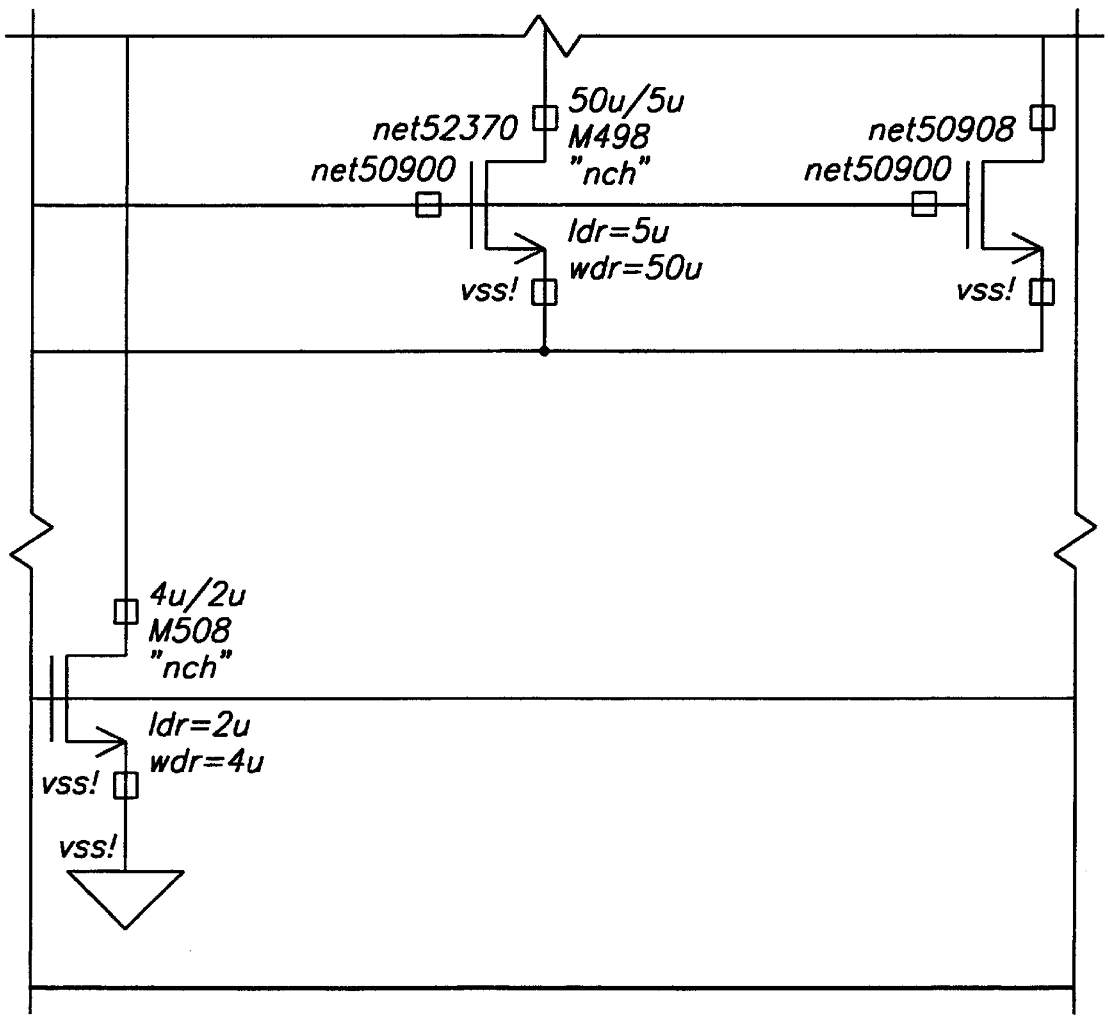
Fig 8.050SEE

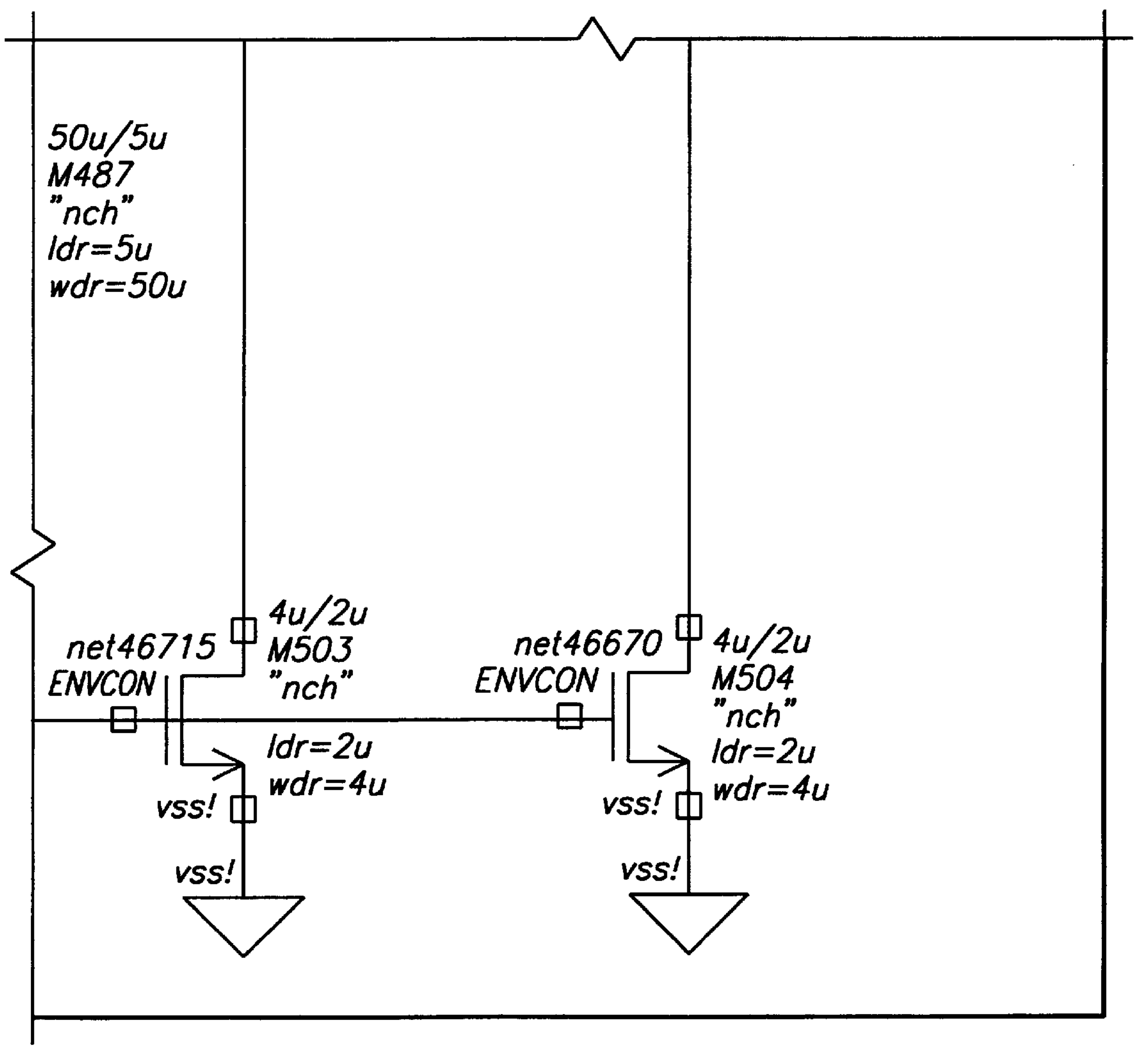
Fig 8.050SEF

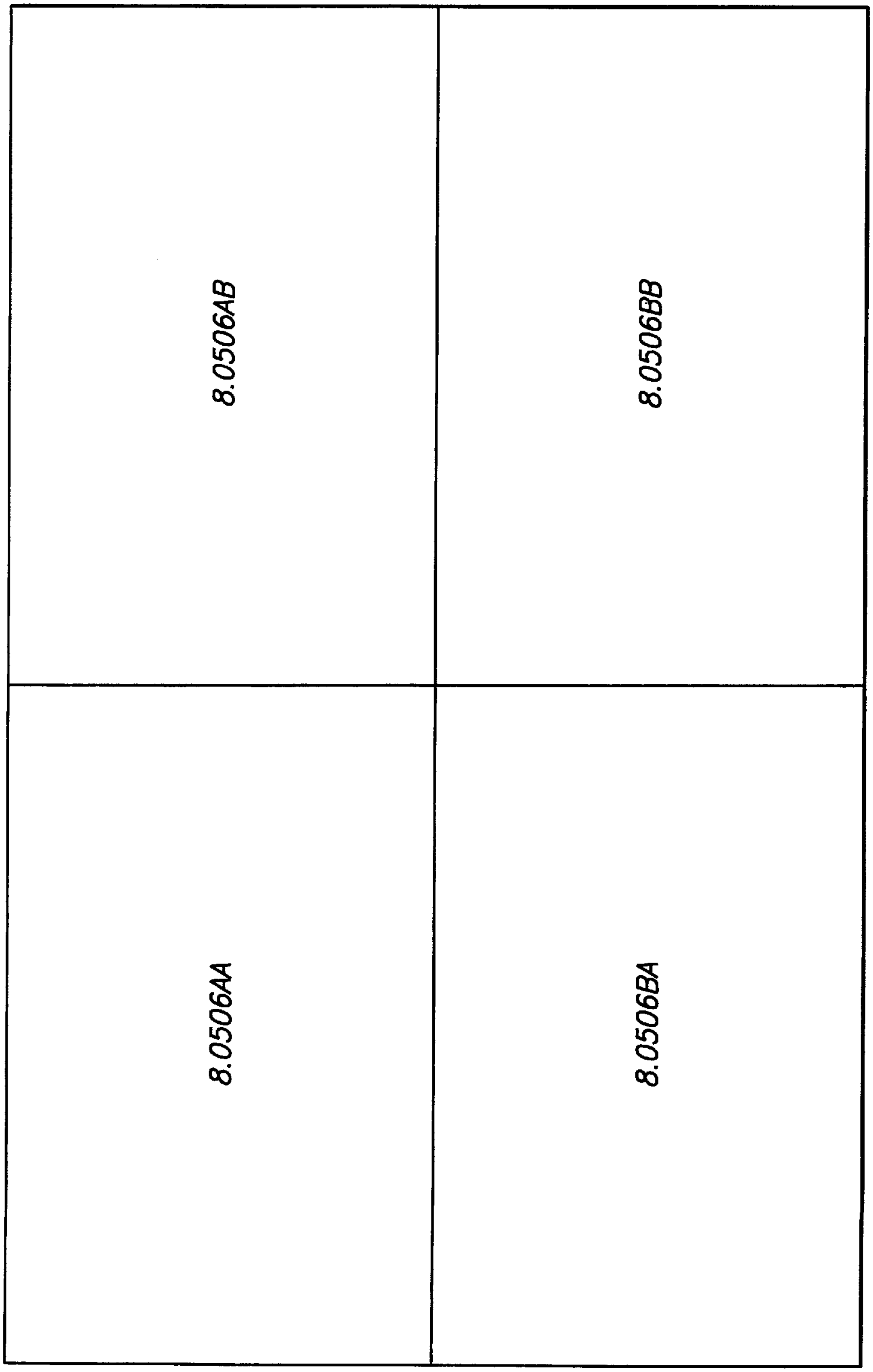
FIG. 8.0506

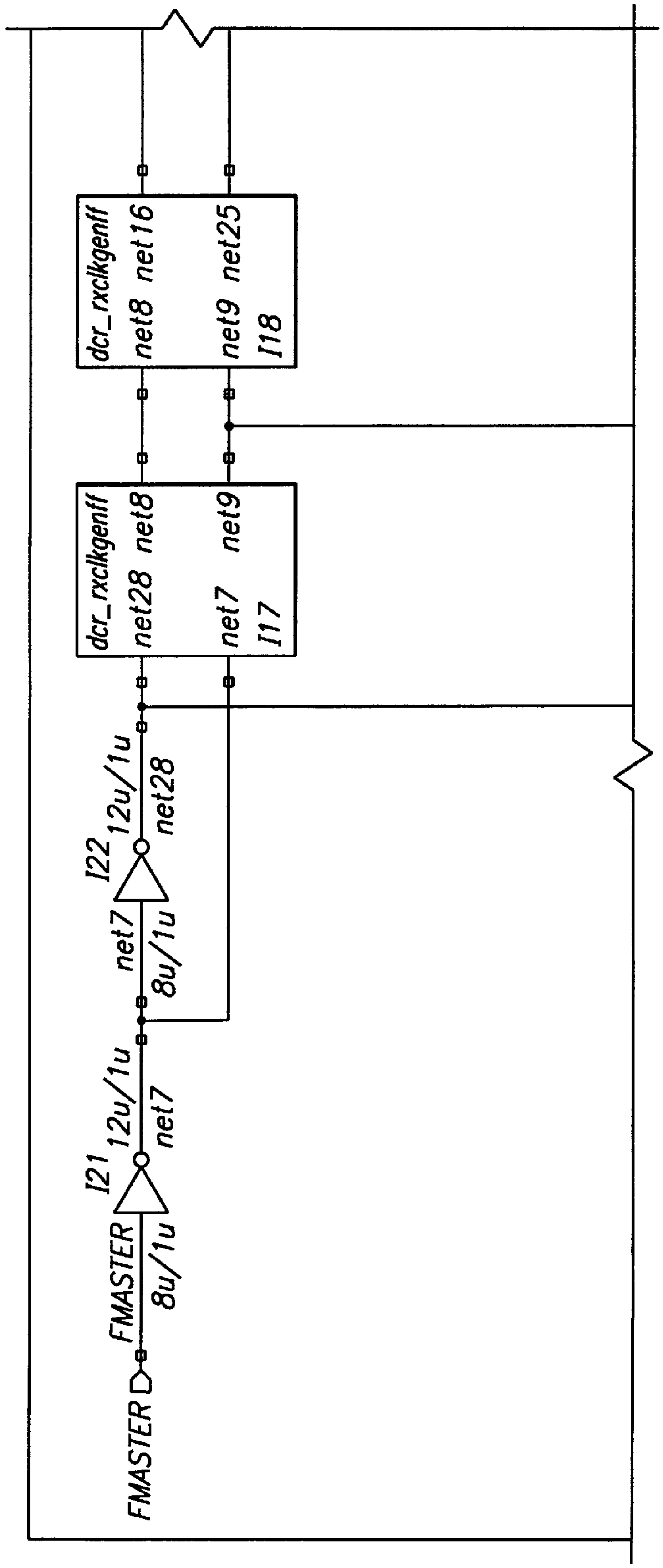
FIG. 8.05GAA

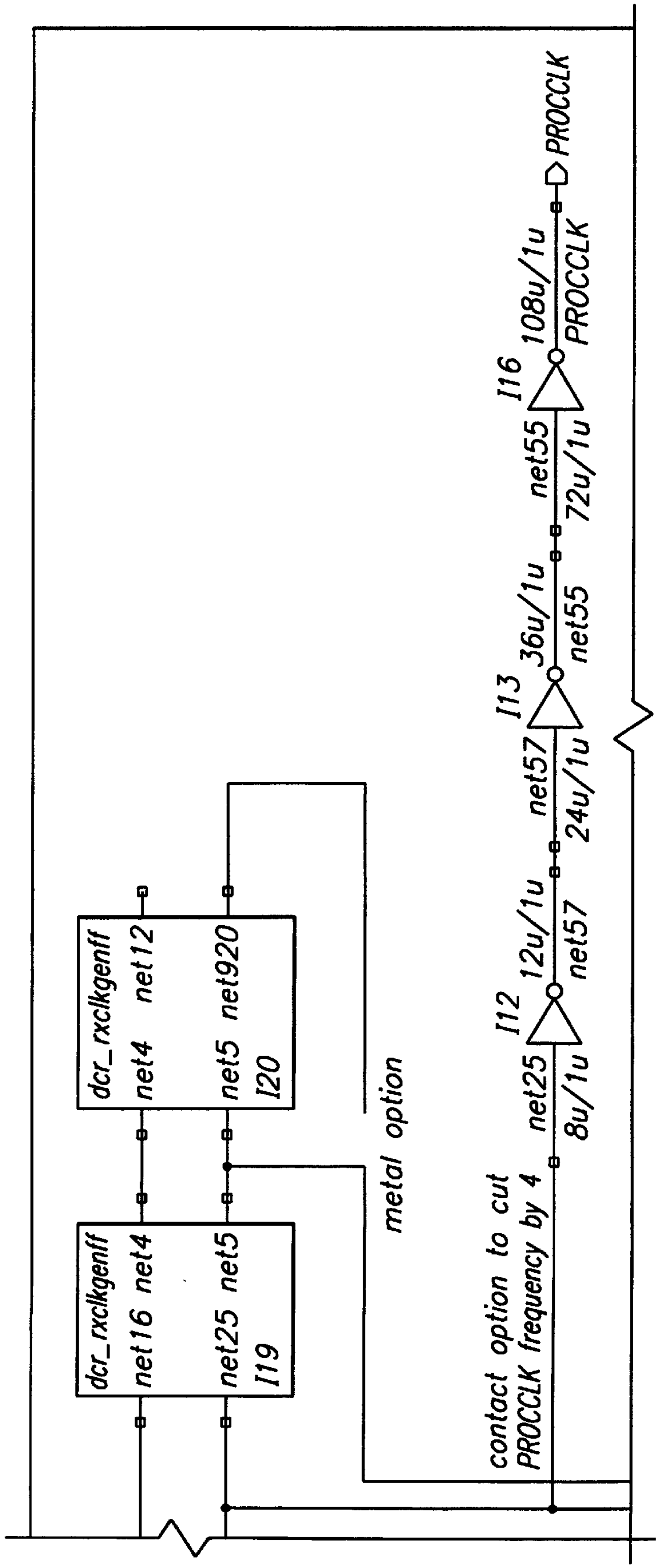
FIG. 8.05GAB

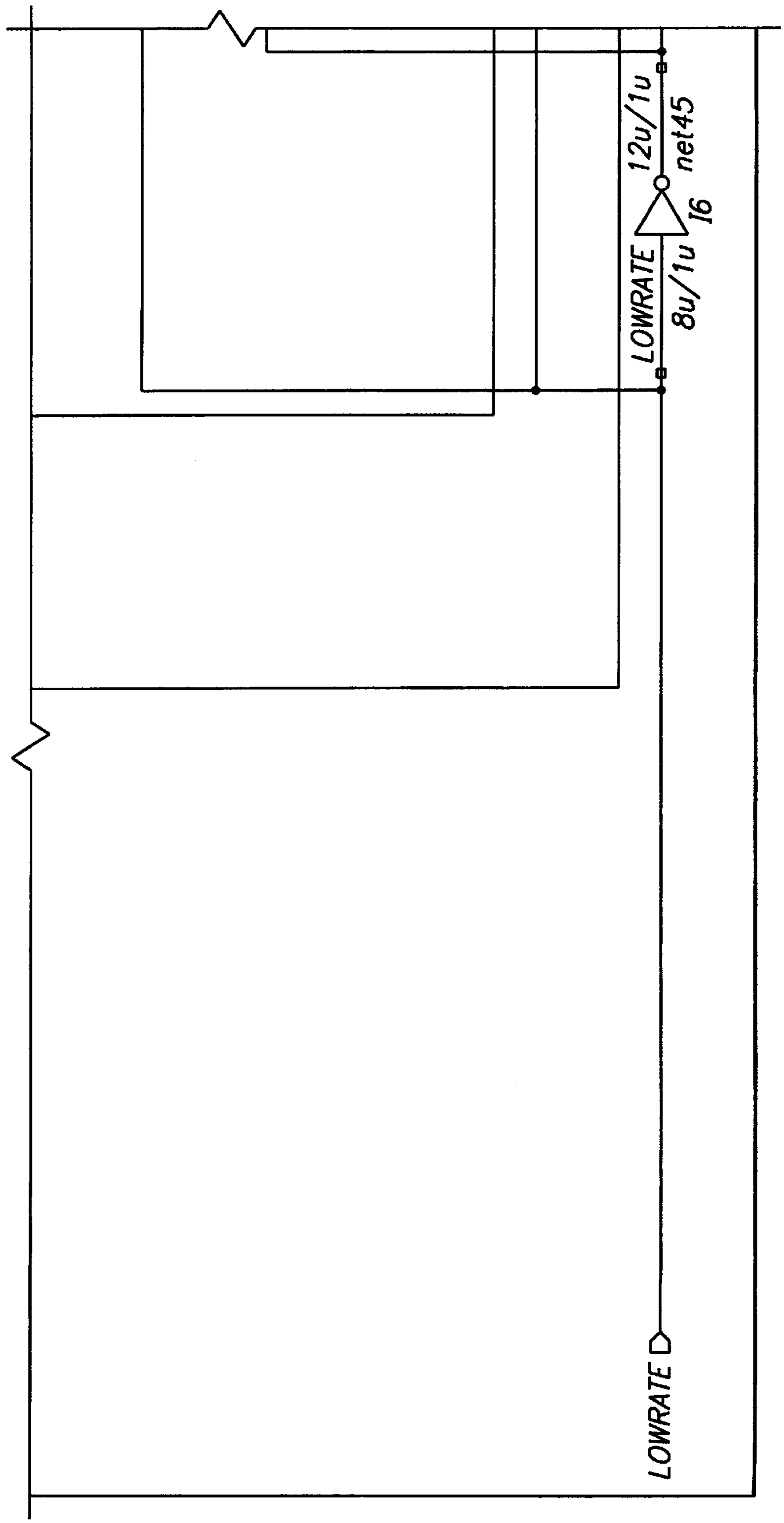
FIG. 8.0506BA

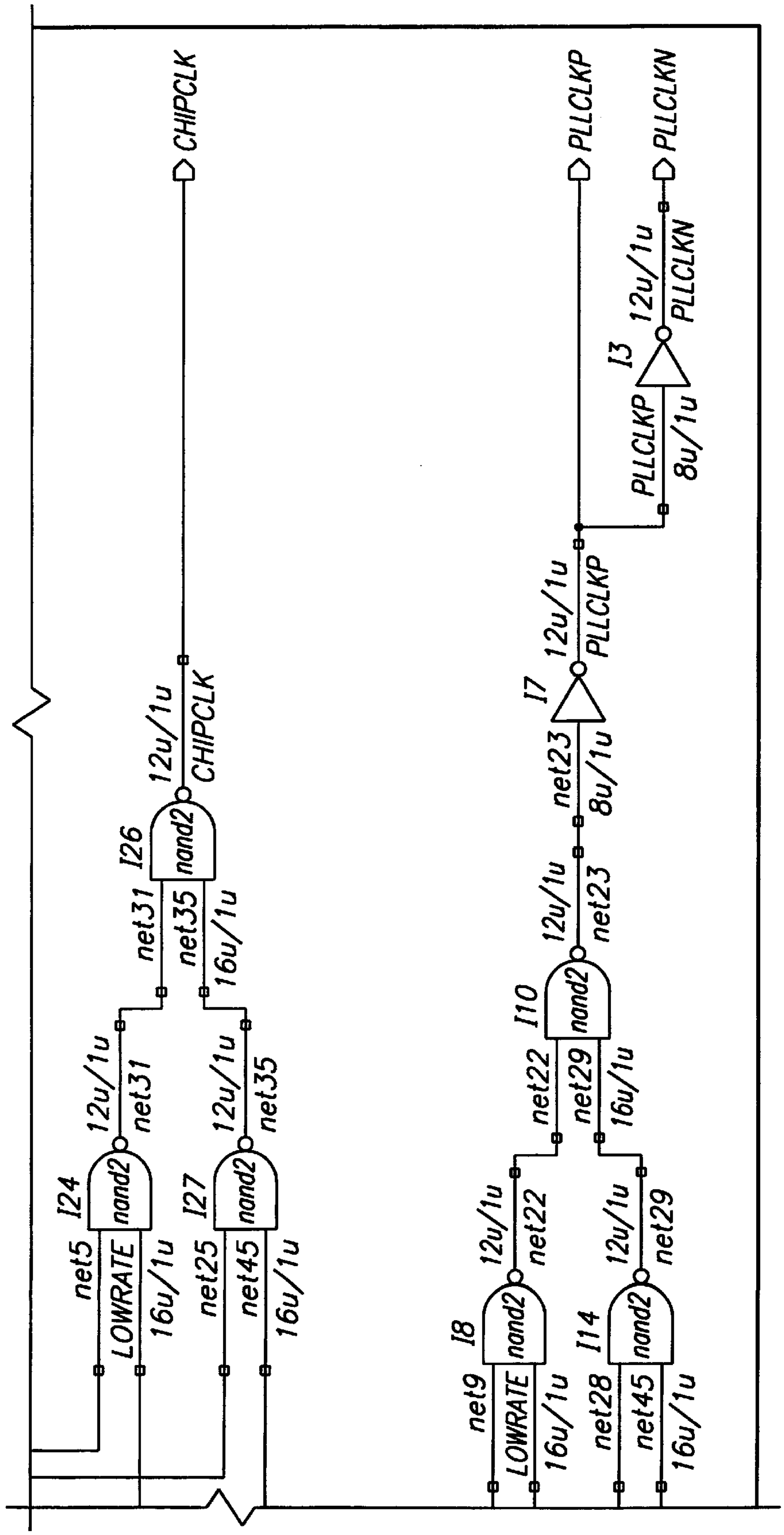
Fig 8.05GBB

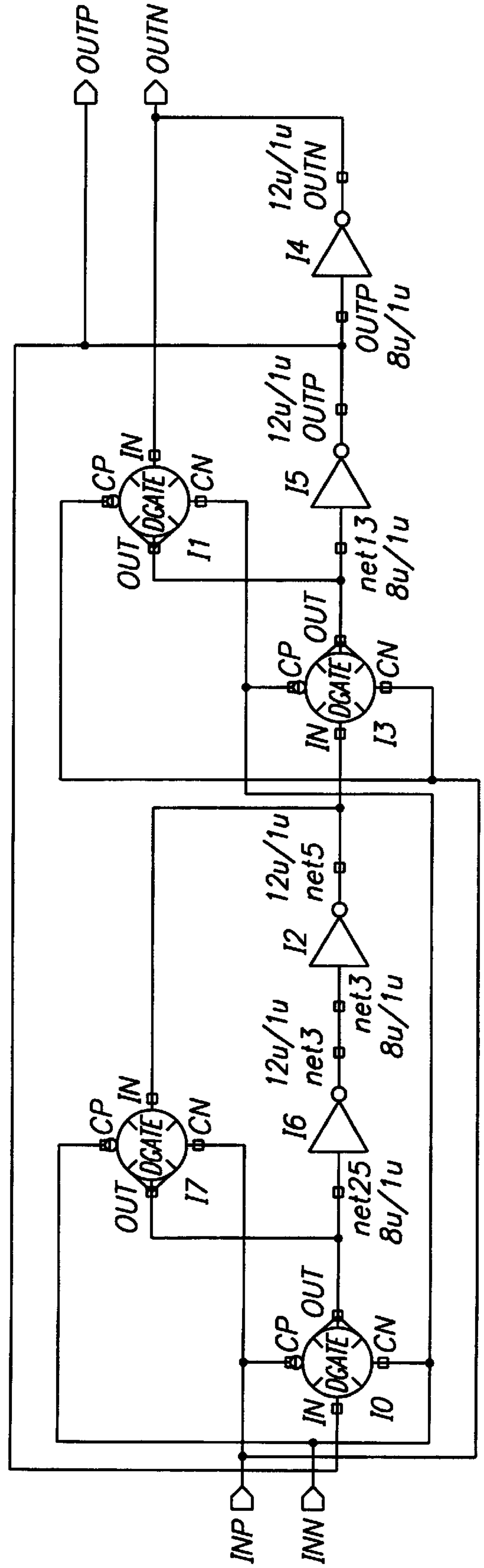
Fig 8.050601

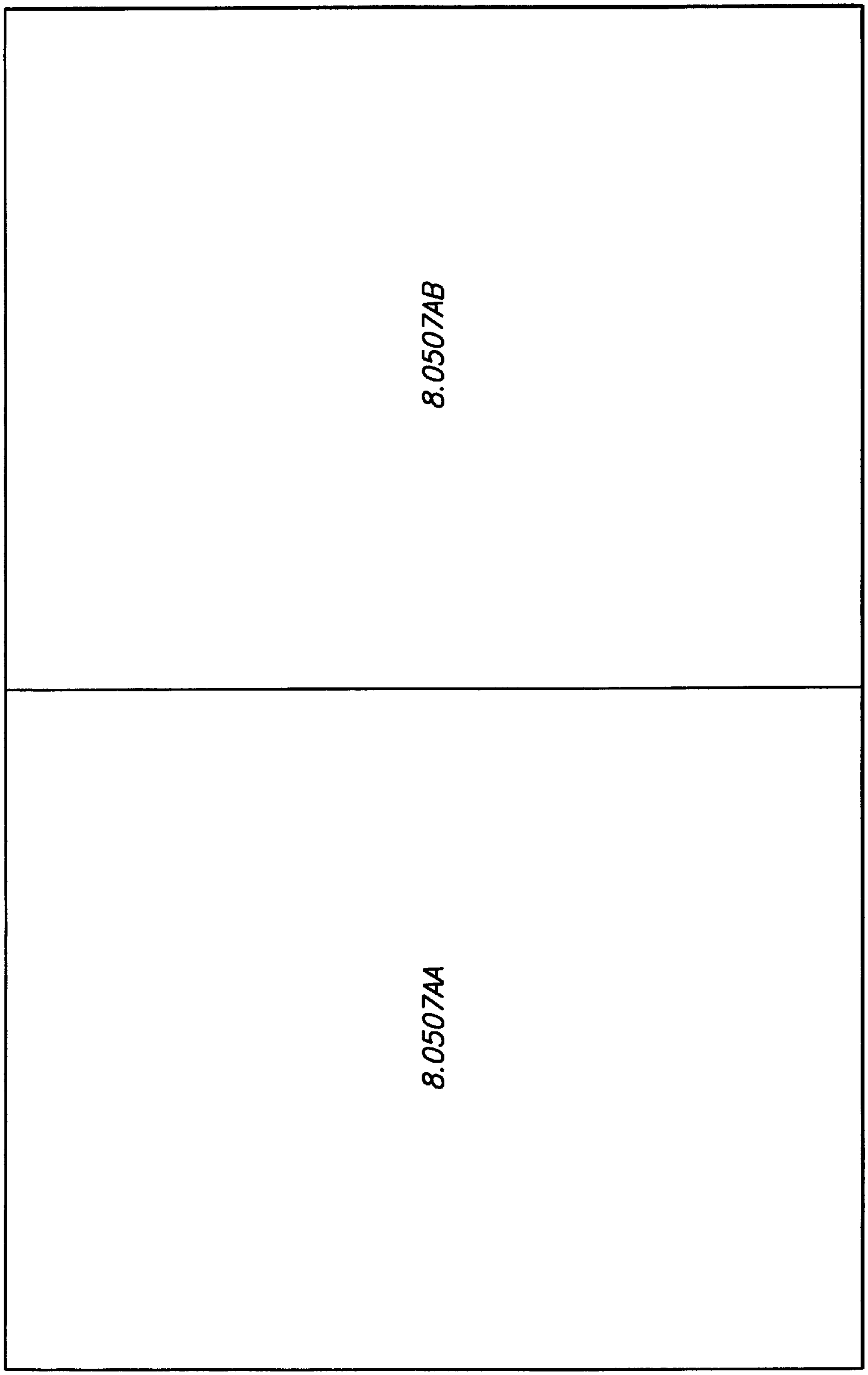
Fig. 8.0507

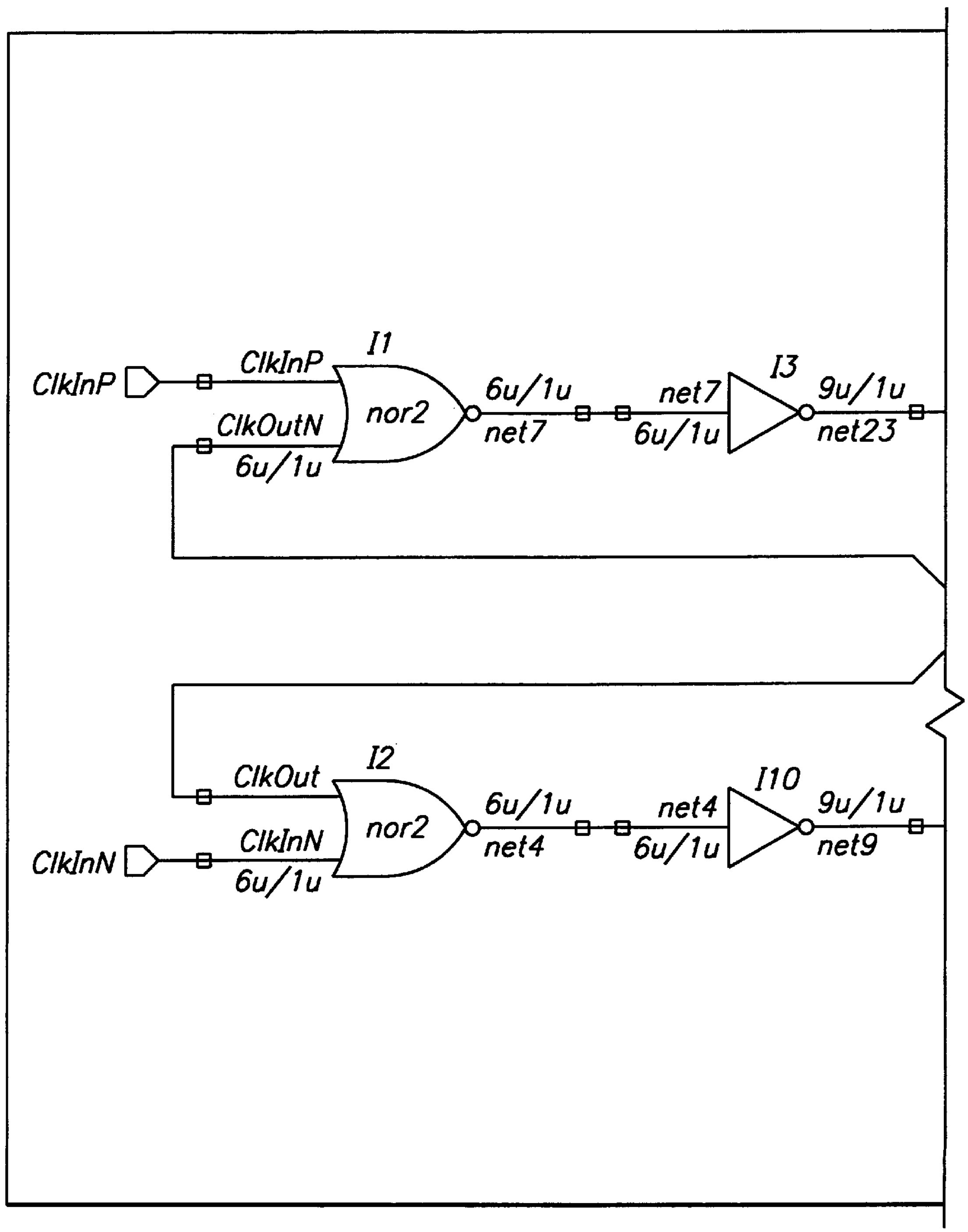
Fig 8.0501AA

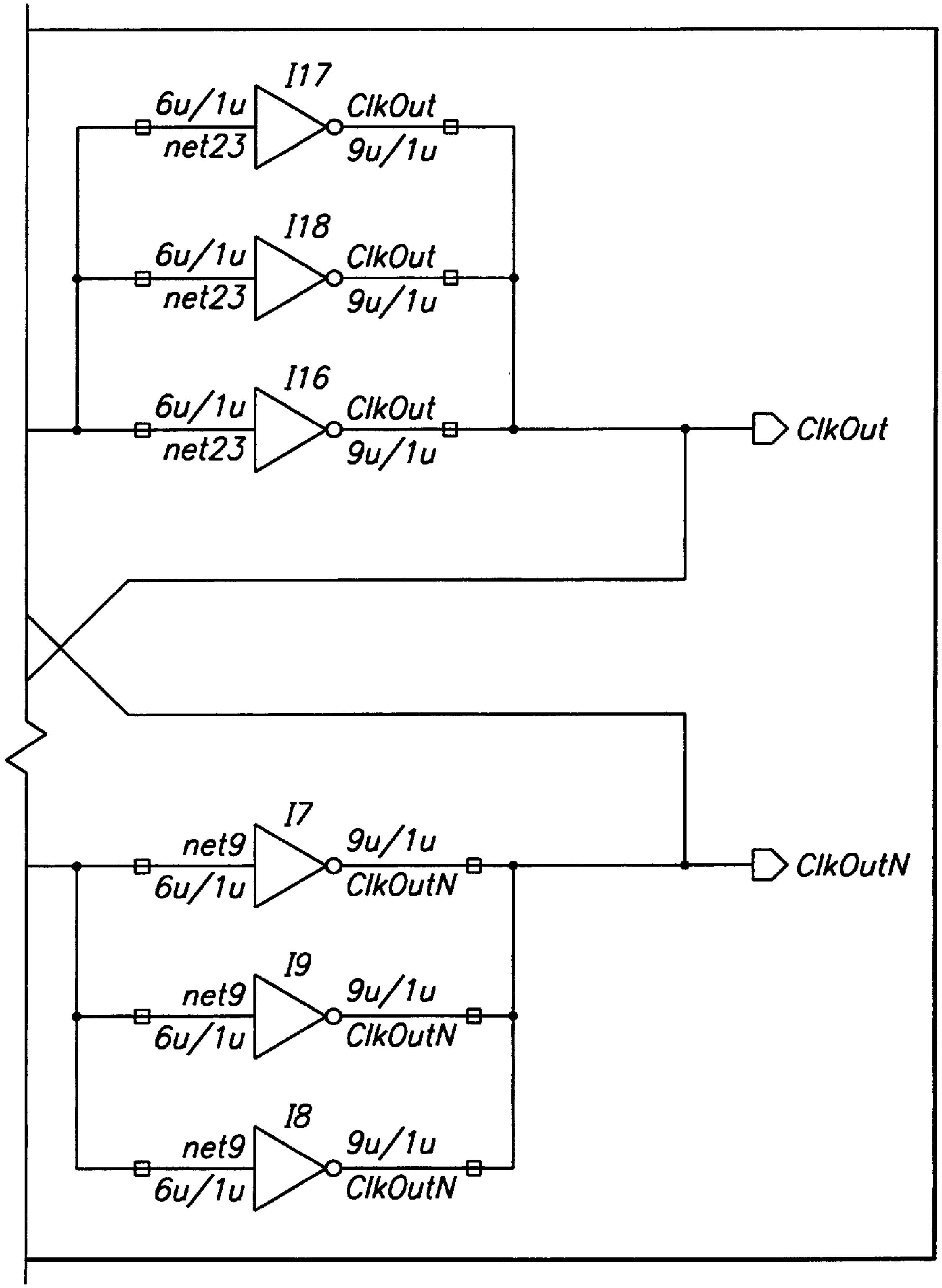
Fig 8.0501AB

| | | | |
|---|---|---|---|
| 8.06AA | 8.06AB | 8.06AC | 8.06AD |
| 8.06BA | 8.06BB | 8.06BC | 8.06BD |
| 8.06CA | 8.06CB | 8.06CC | 8.06CD |
| 8.06DA | 8.06DB | 8.06DC | 8.06DD |
| 8.06EA | 8.06EB | 8.06EC | 8.06ED |

FIG. 8.06

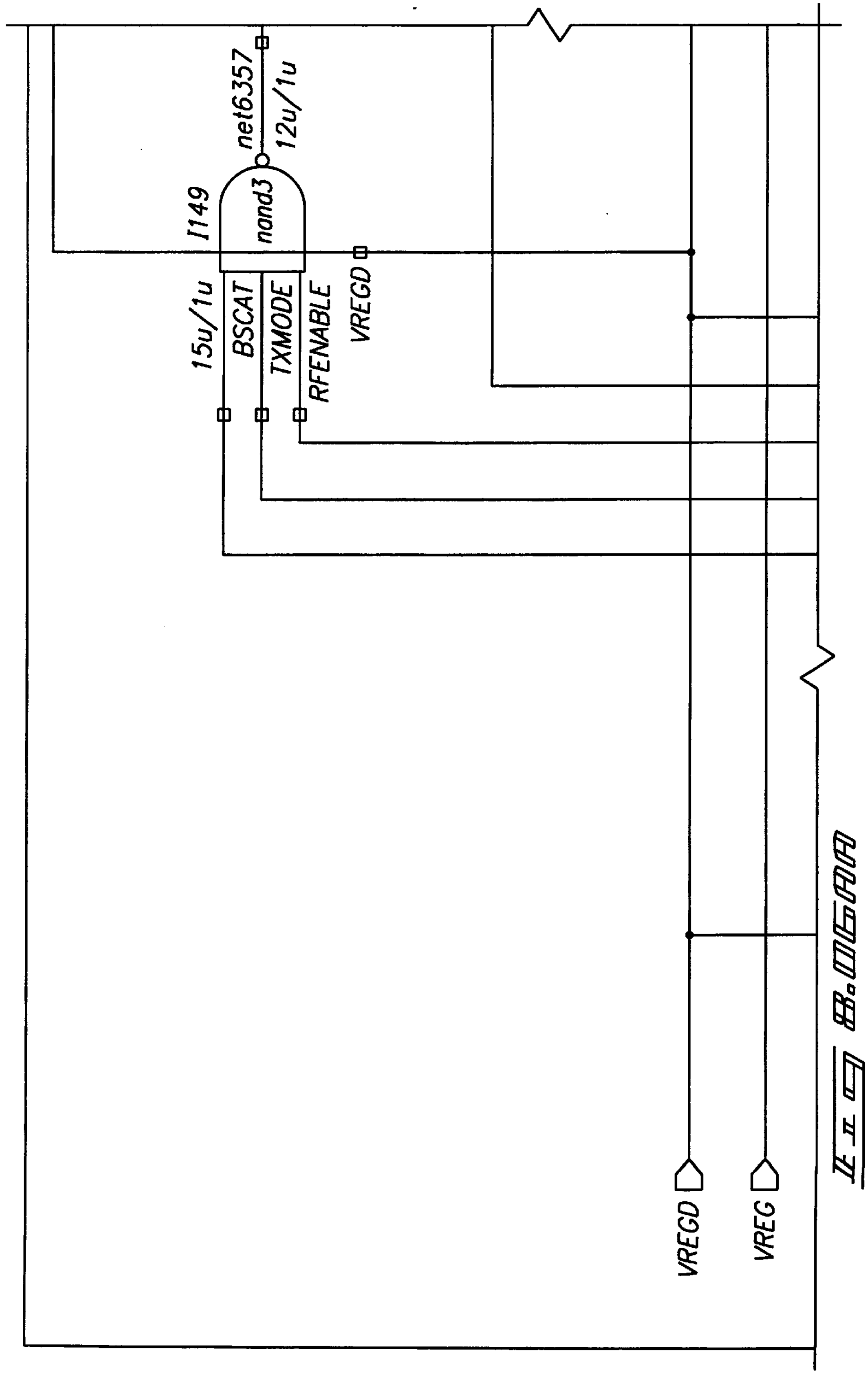
FIG. 8.06AA

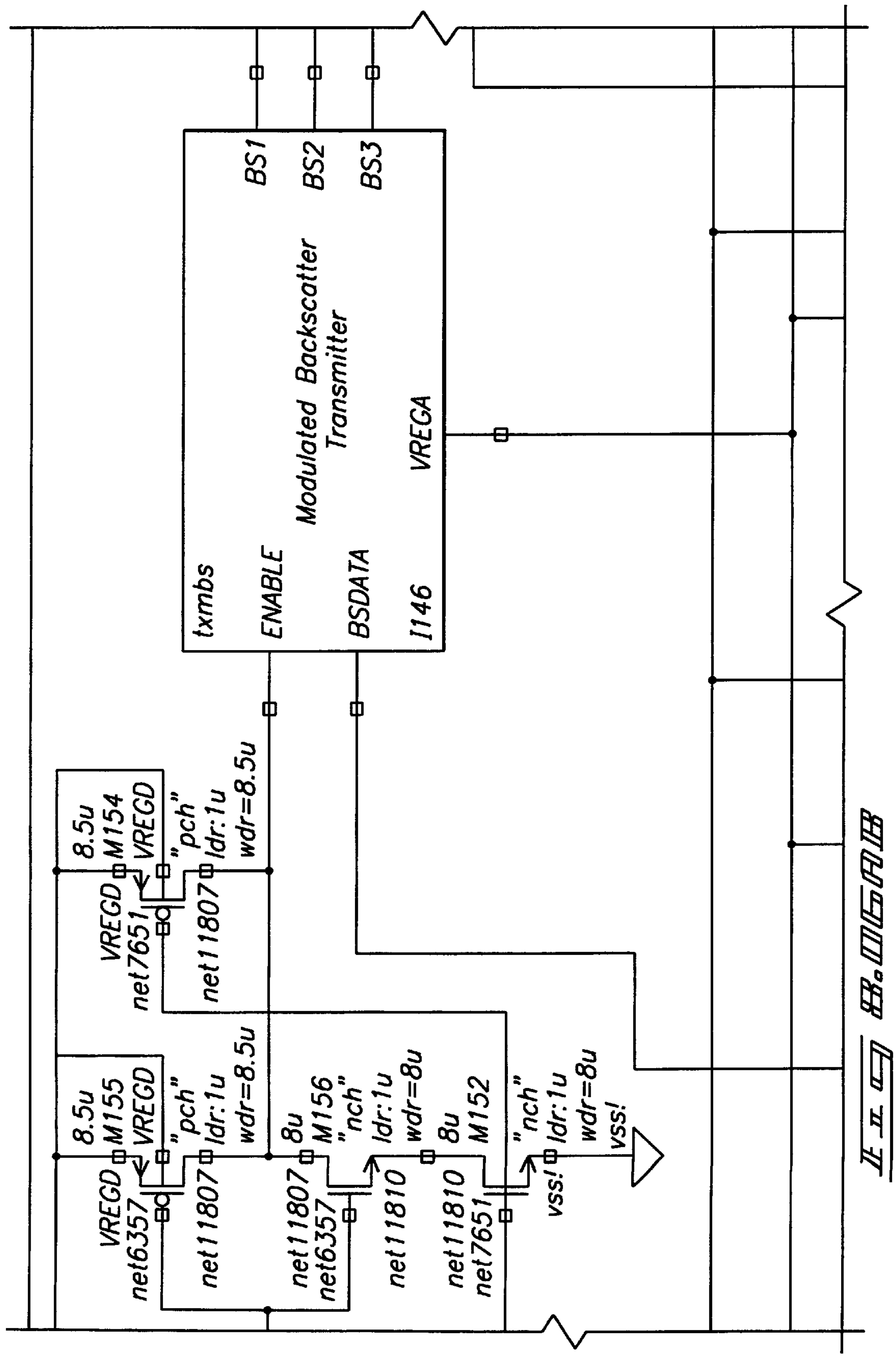
Modulated Backscatter Transmitter
txmbs
ENABLE
BSDATA
I146
BS1
BS2
BS3
VREGA
8.5u
M154
VREGD
"pch"
ldr:1u
wdr=8.5u
VREGD
net7651
net11807
8.5u
M155
VREGD
"pch"
ldr:1u
wdr=8.5u
VREGD
net6357
net11807
8u
M156
"nch"
ldr:1u
wdr=8u
net11807
net6357
net11810
8u
M152
"nch"
ldr:1u
wdr=8u
vss!
net11810
net7651
vss!

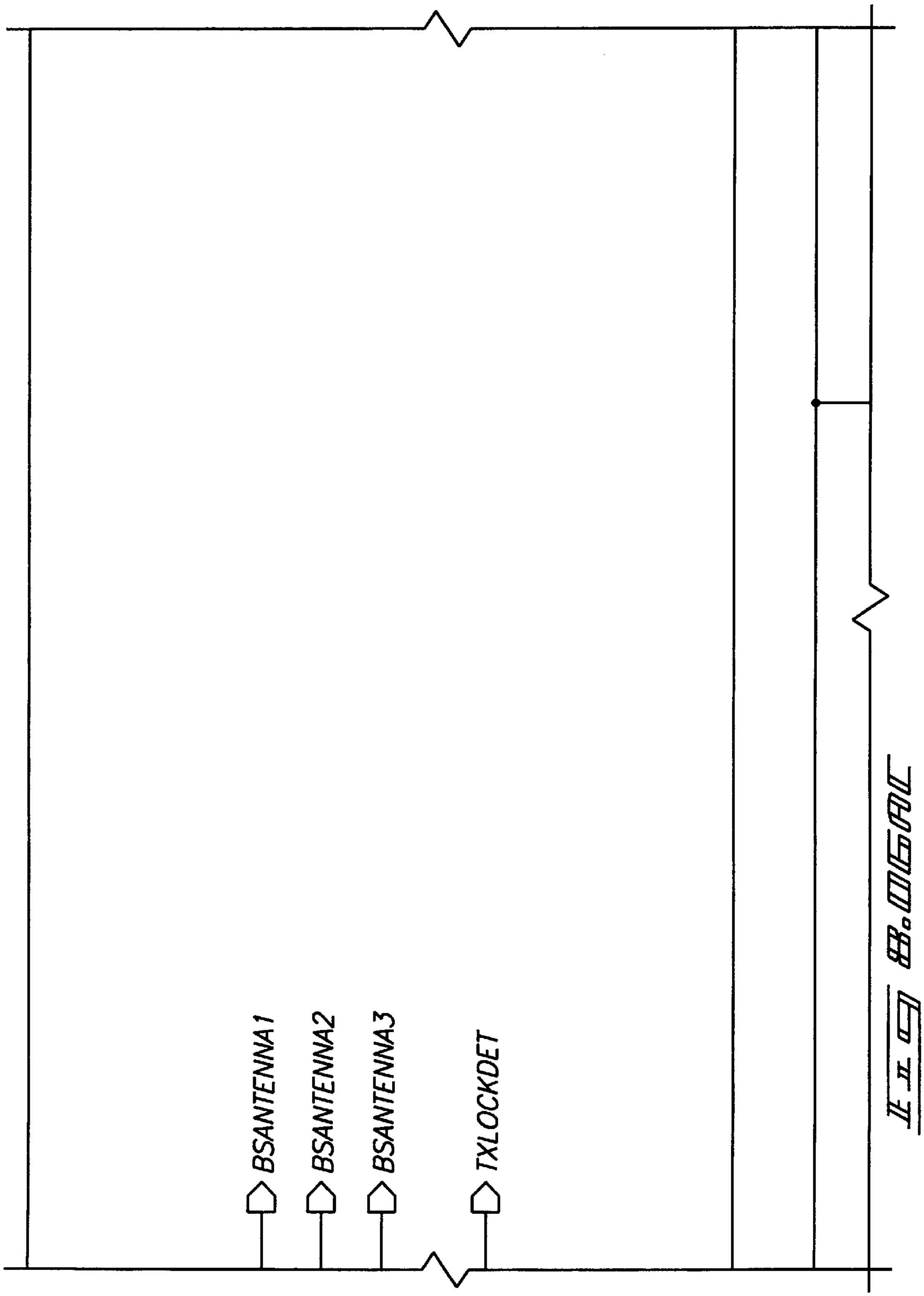
Fig 8.06AL

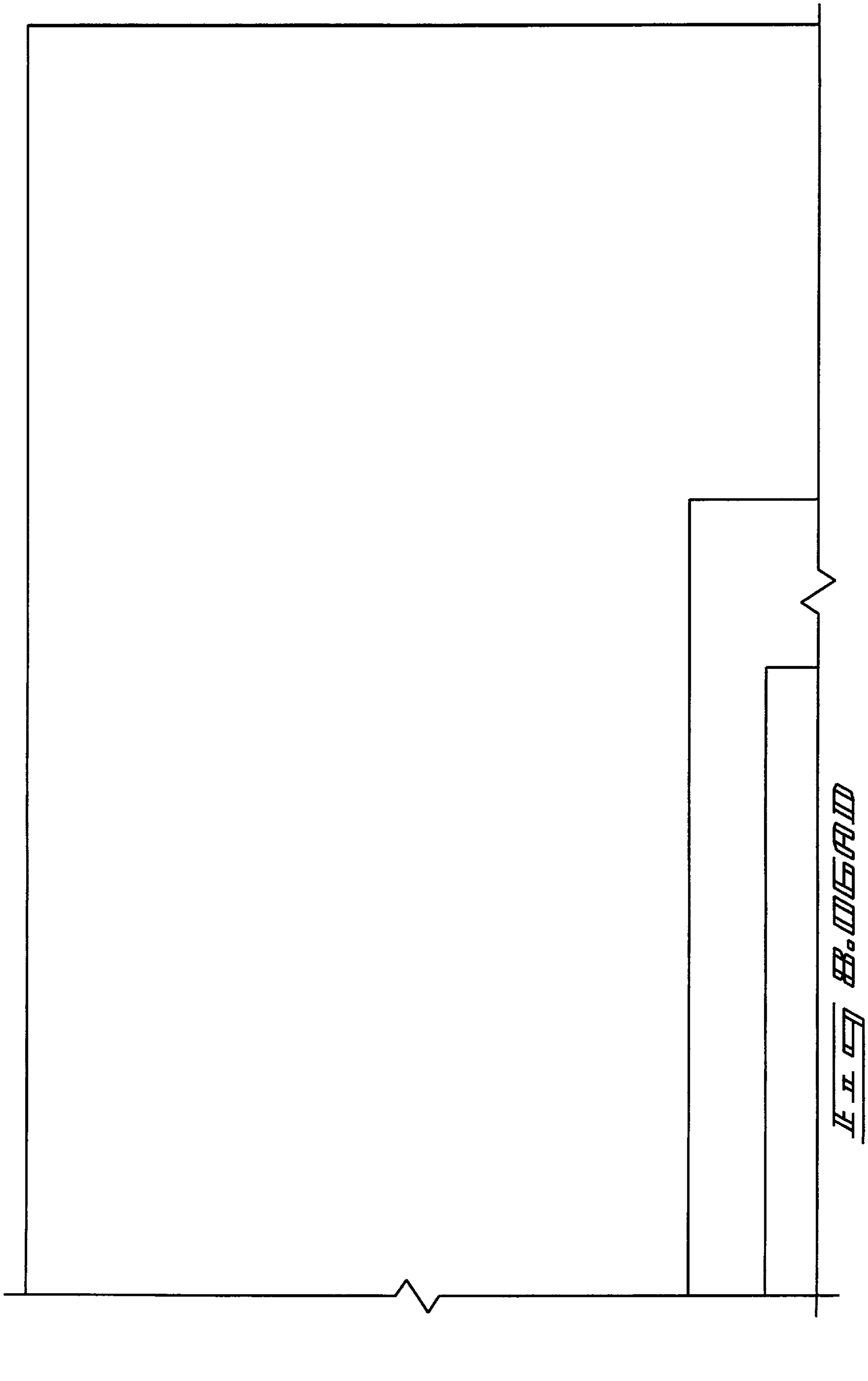
Fig. 8.06AD

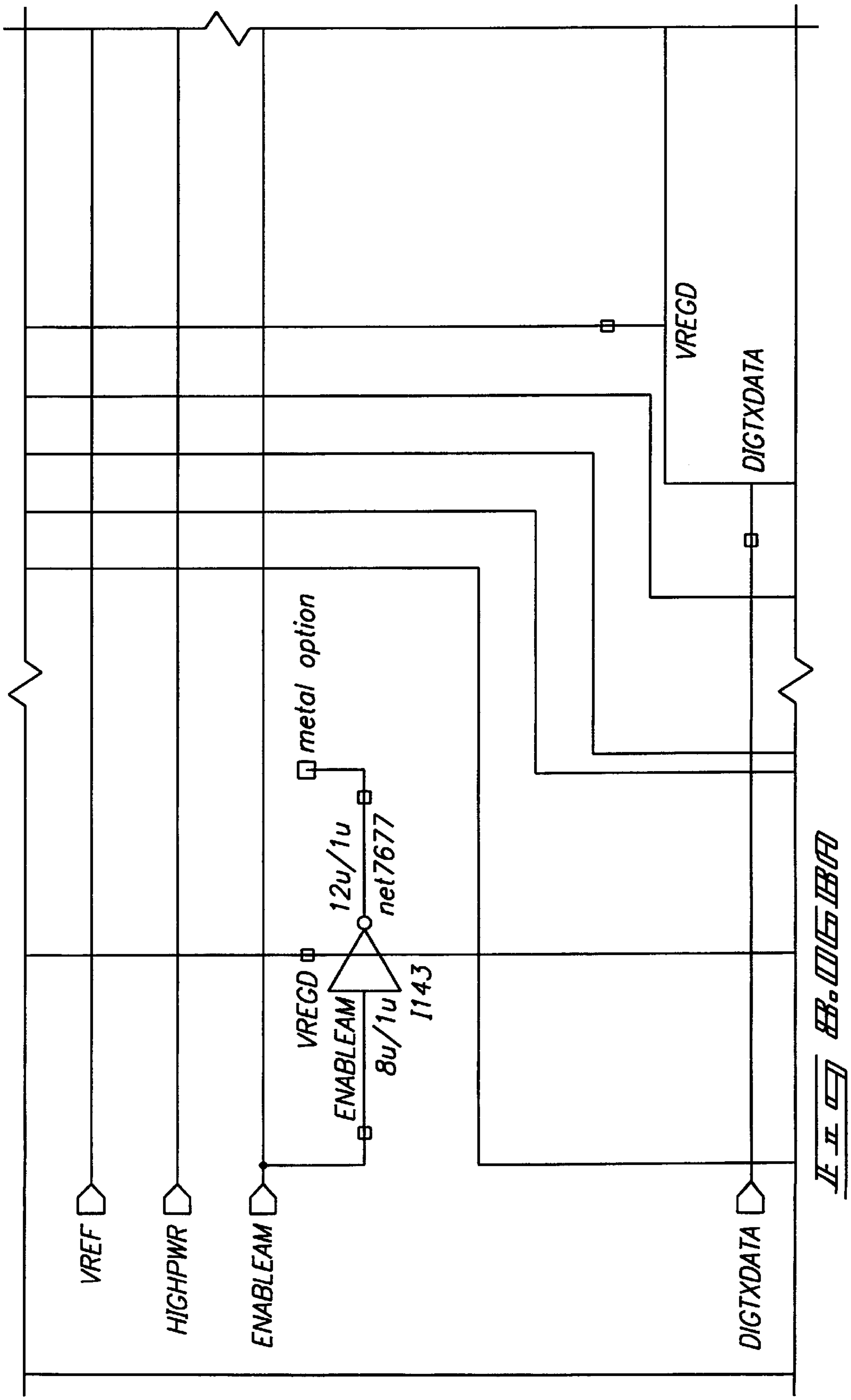
FIG. 8.06BA

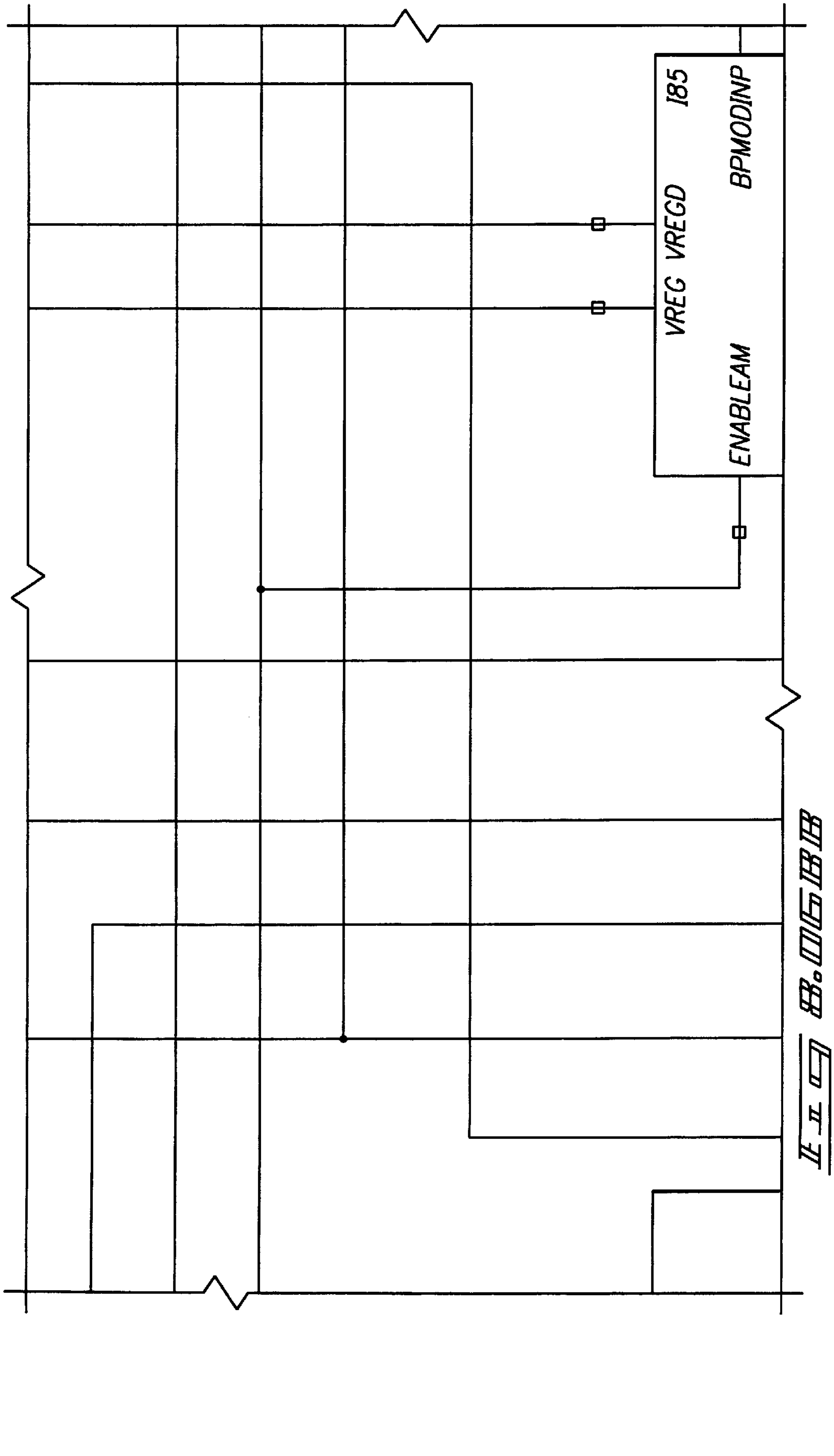
FIG. 8.06BB

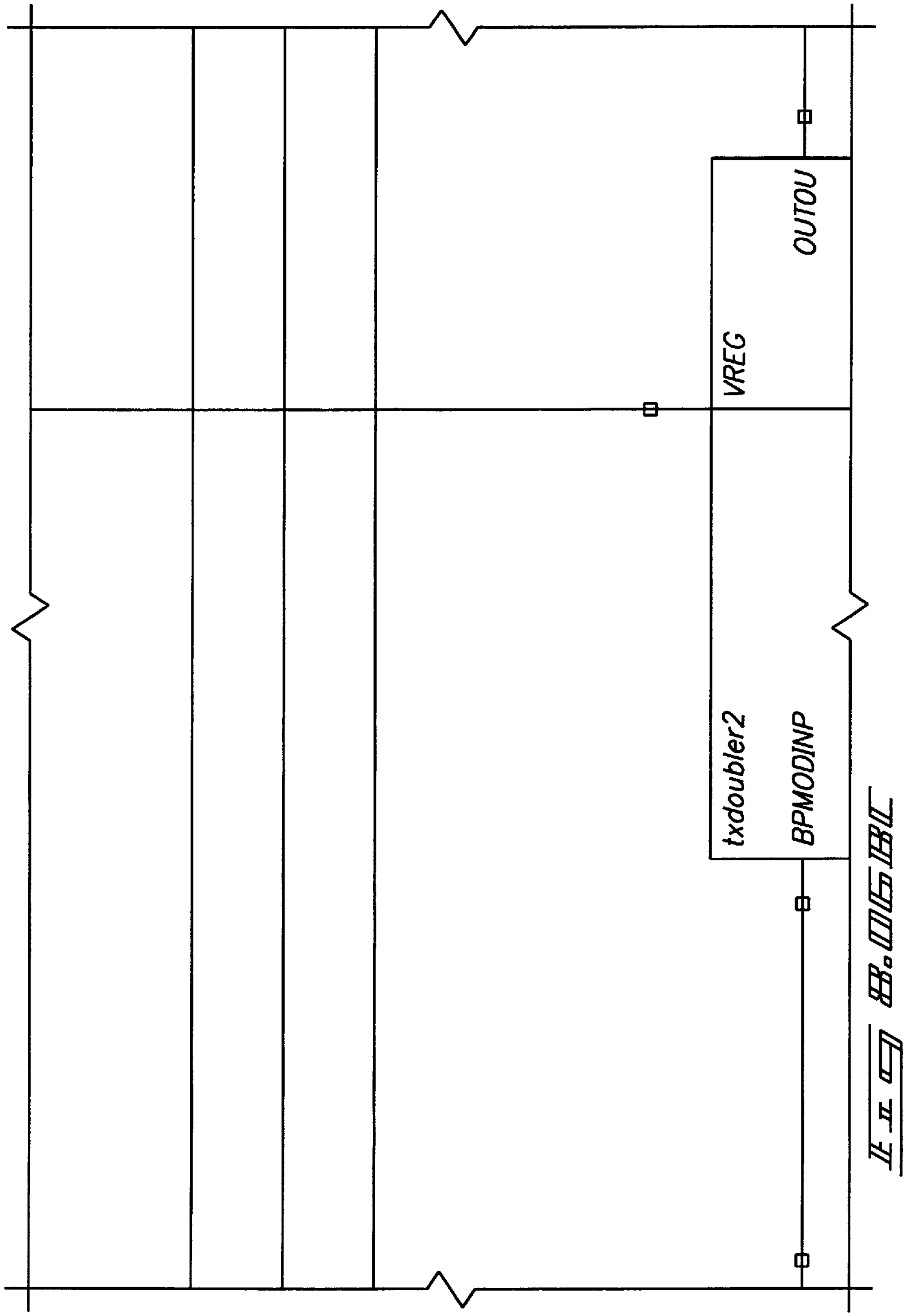
Fig. 8.06BC

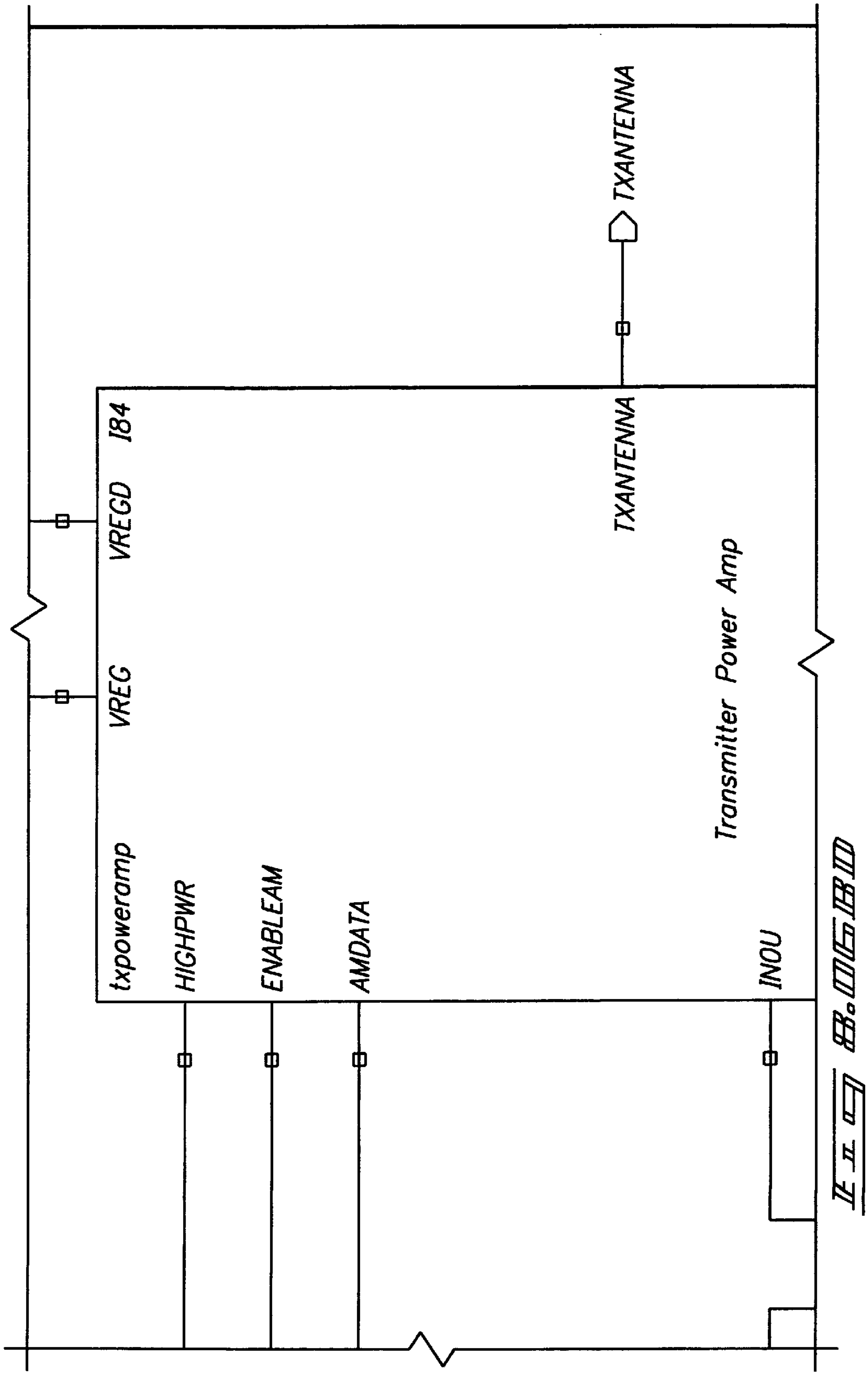
FIG. 8.06BD

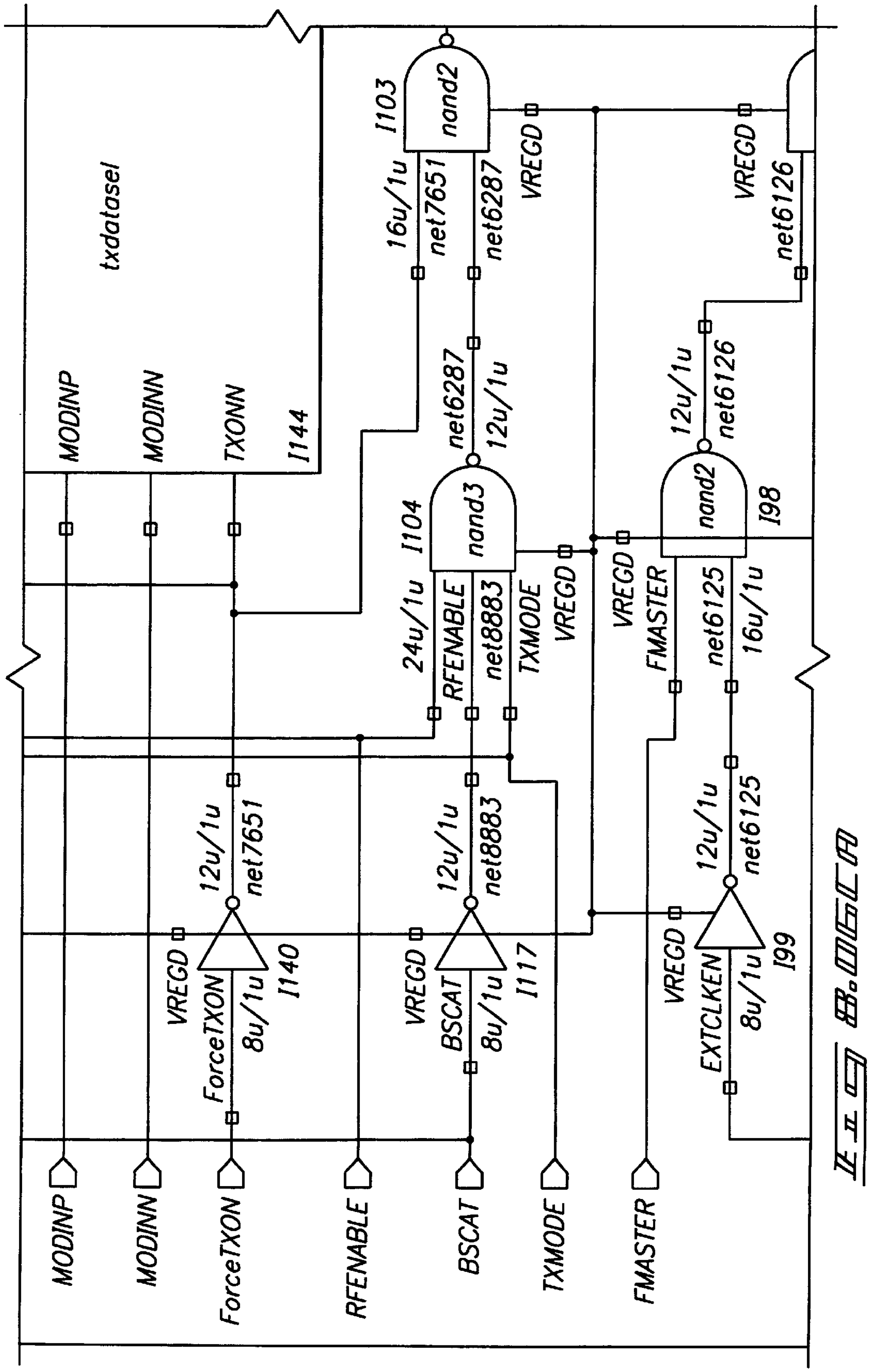
Fig. 8.OMGCA

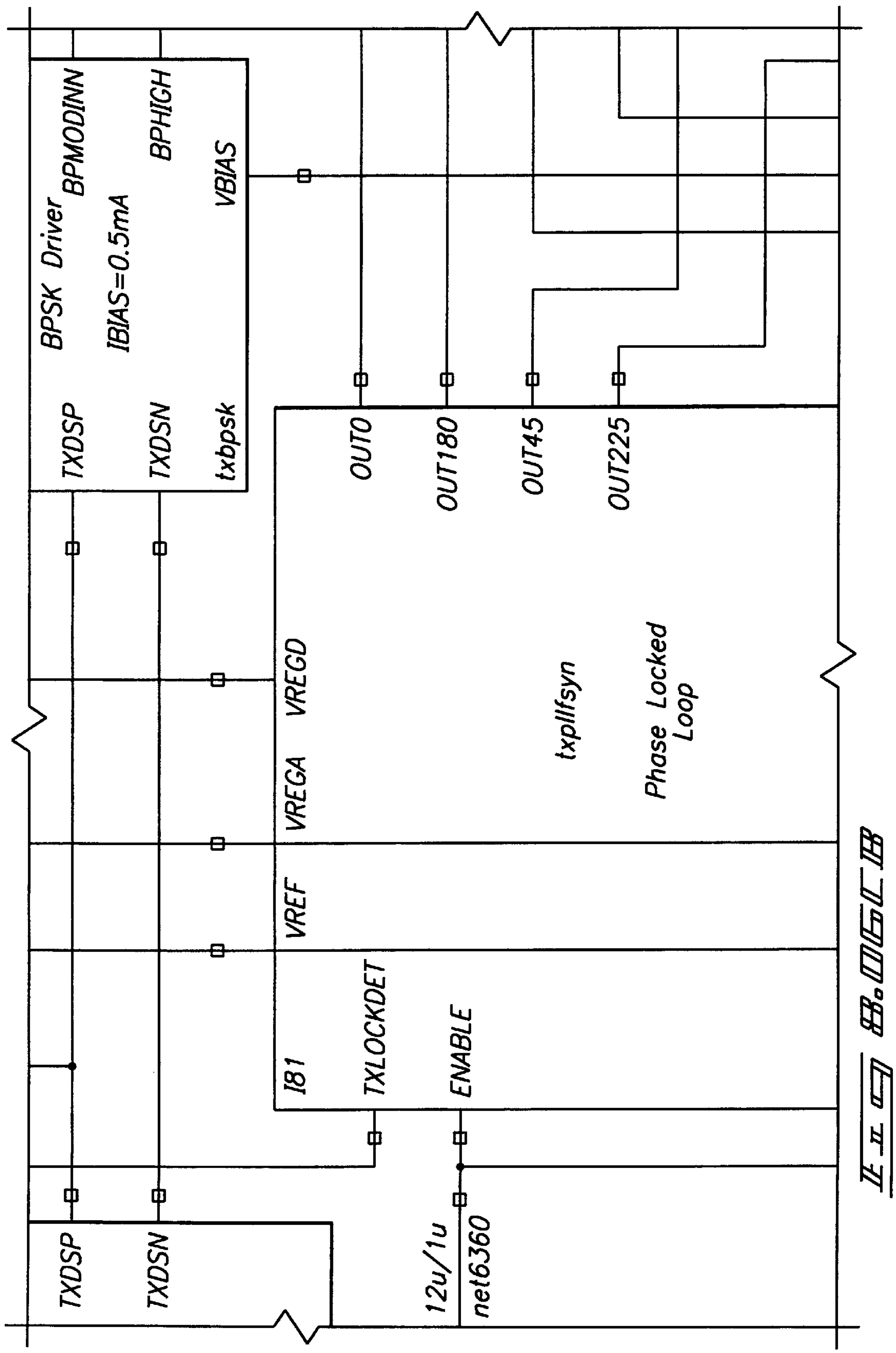
FIG. 8.06CB

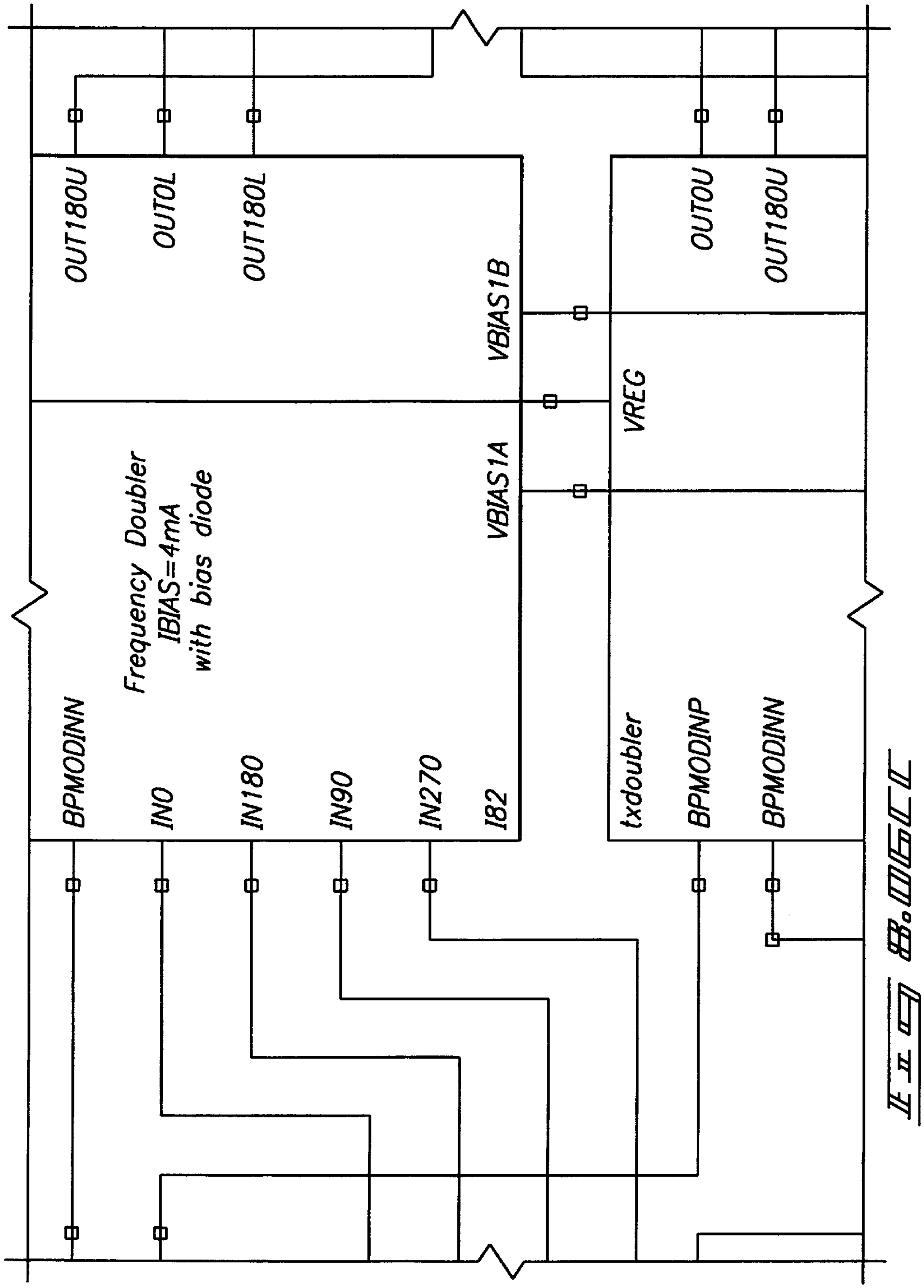
Fig 8.06CC

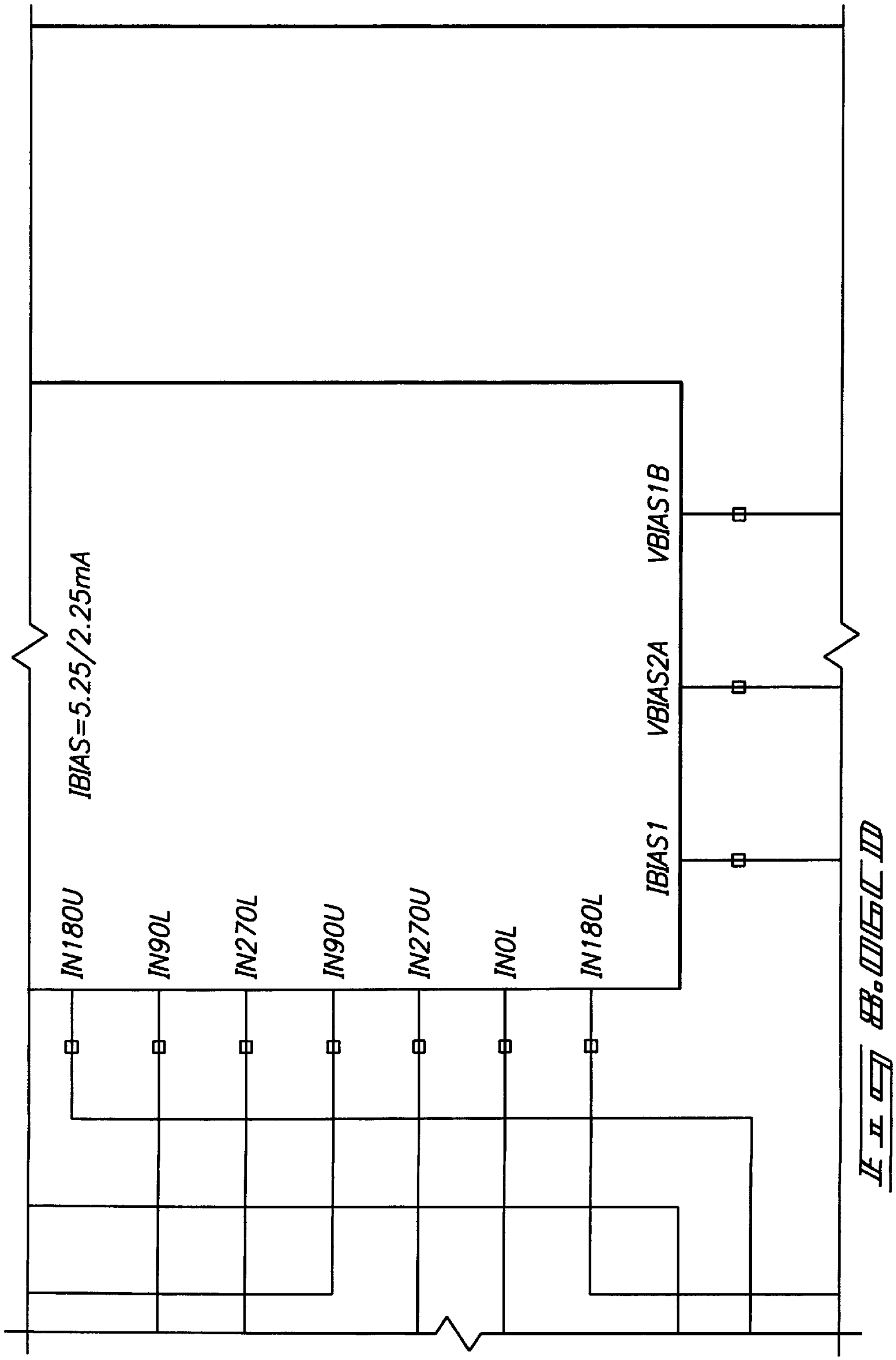
Fig 8.06CD

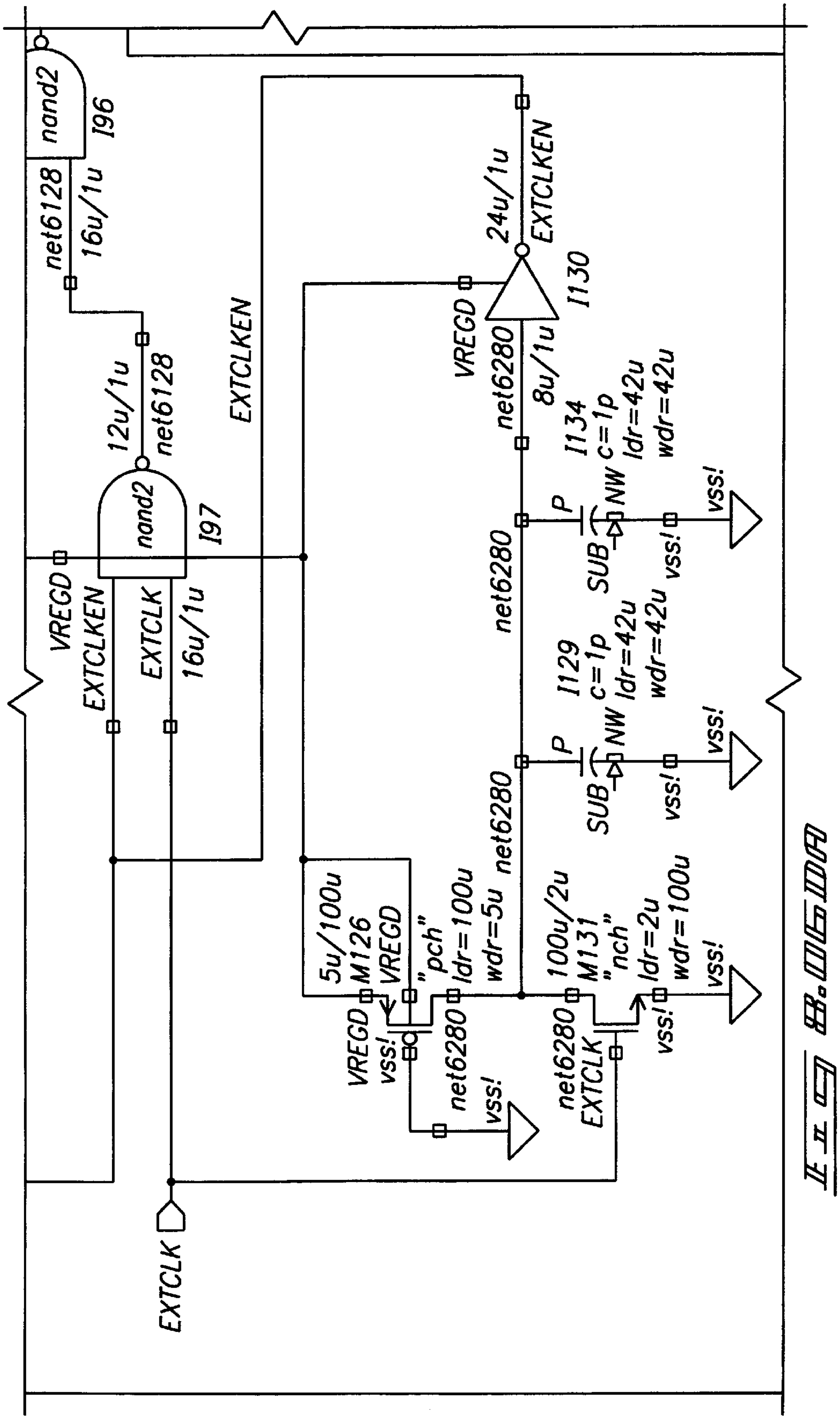
FIG. 8.06DA

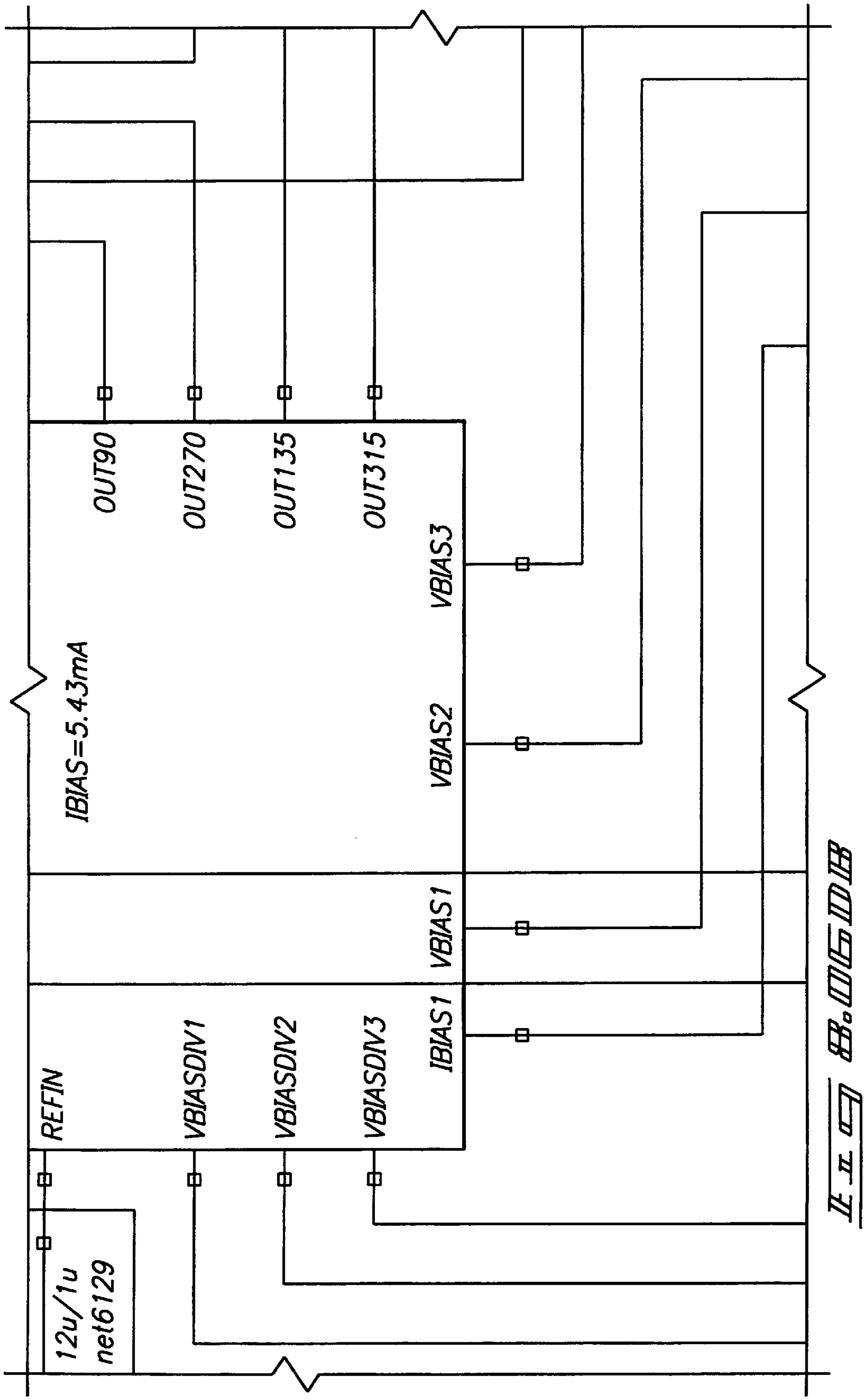
Fig. 8.06DB

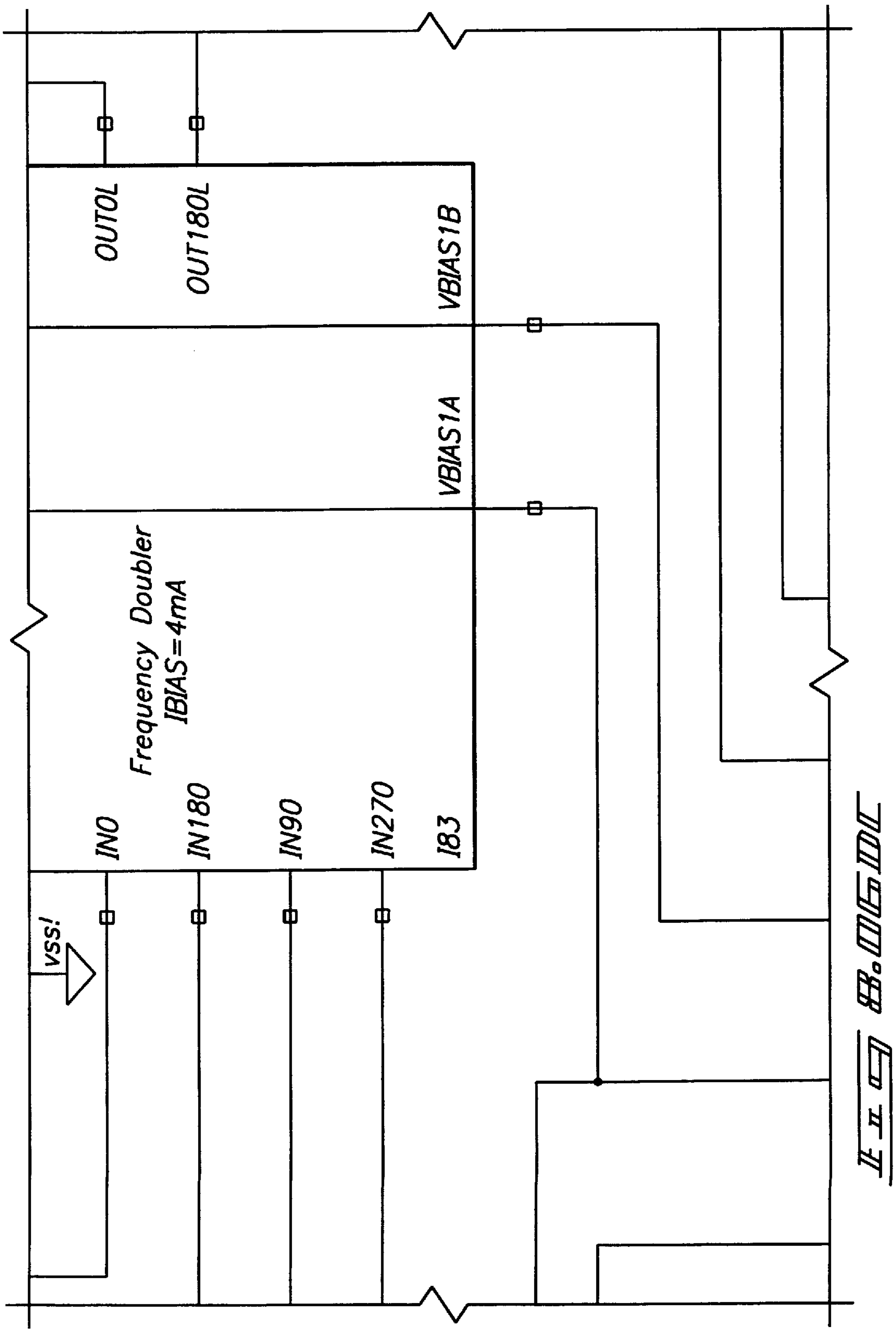
FIG. 8.06DC

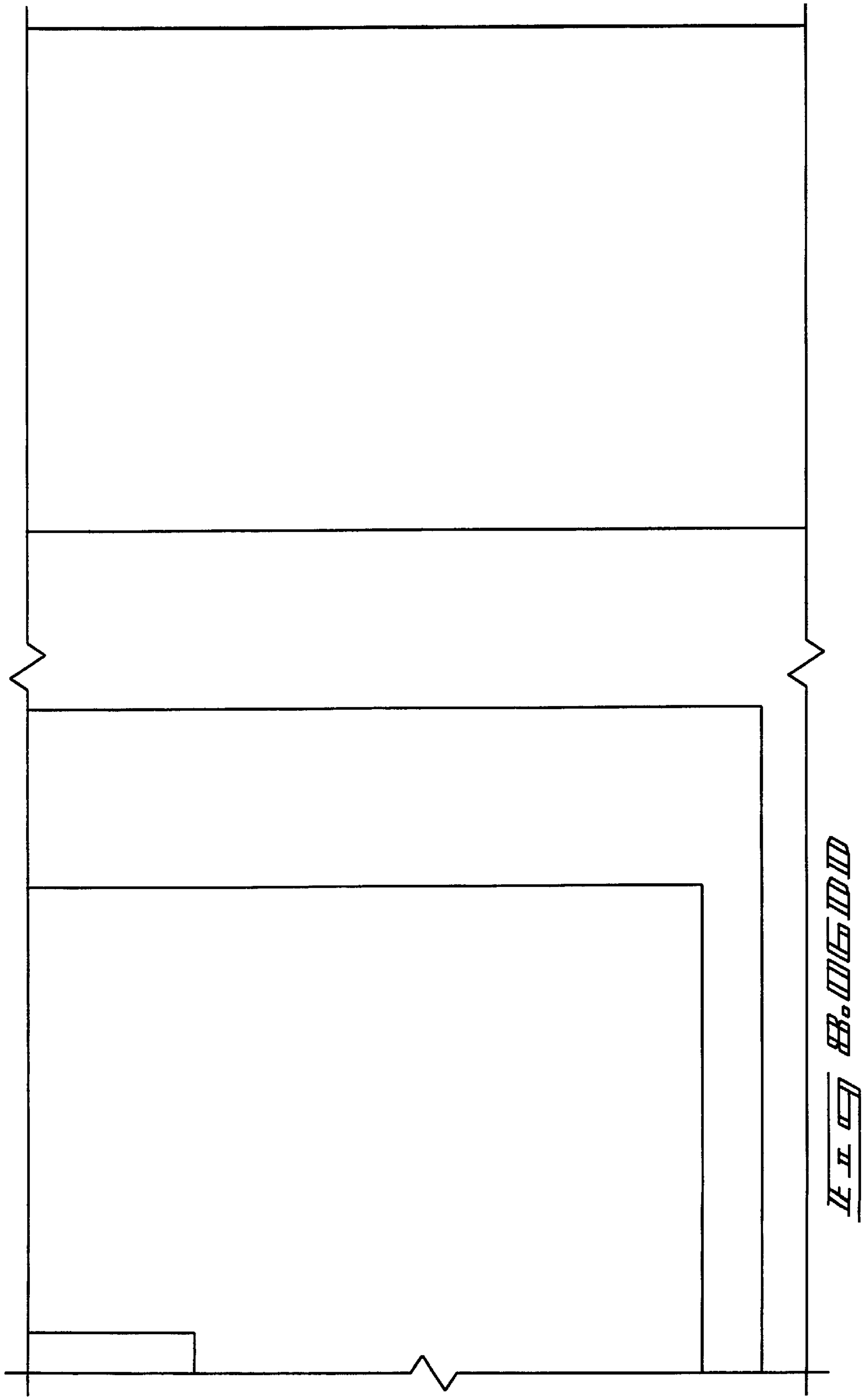
FIG. 8.06DD

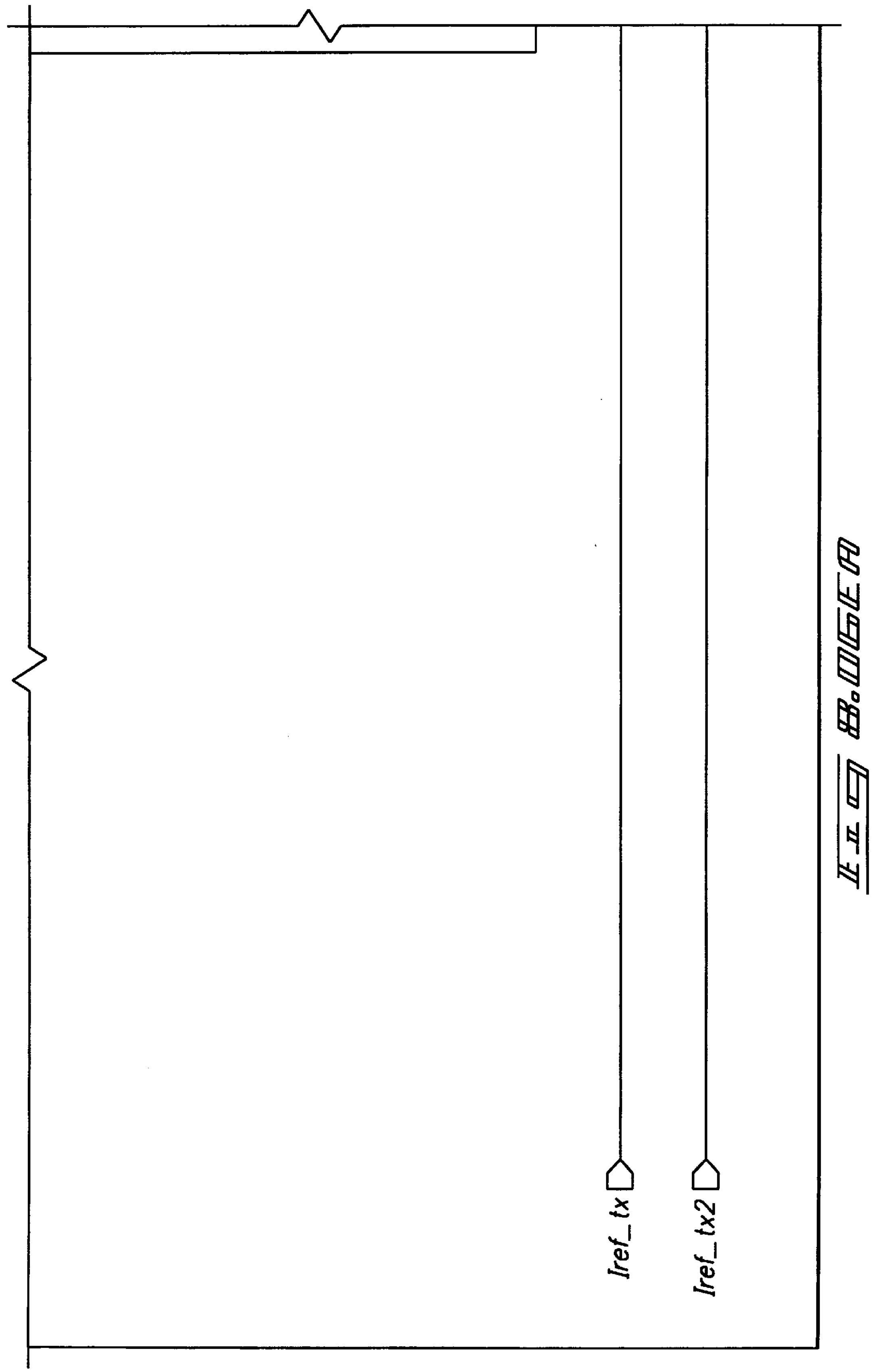
FIG. 8.06EA

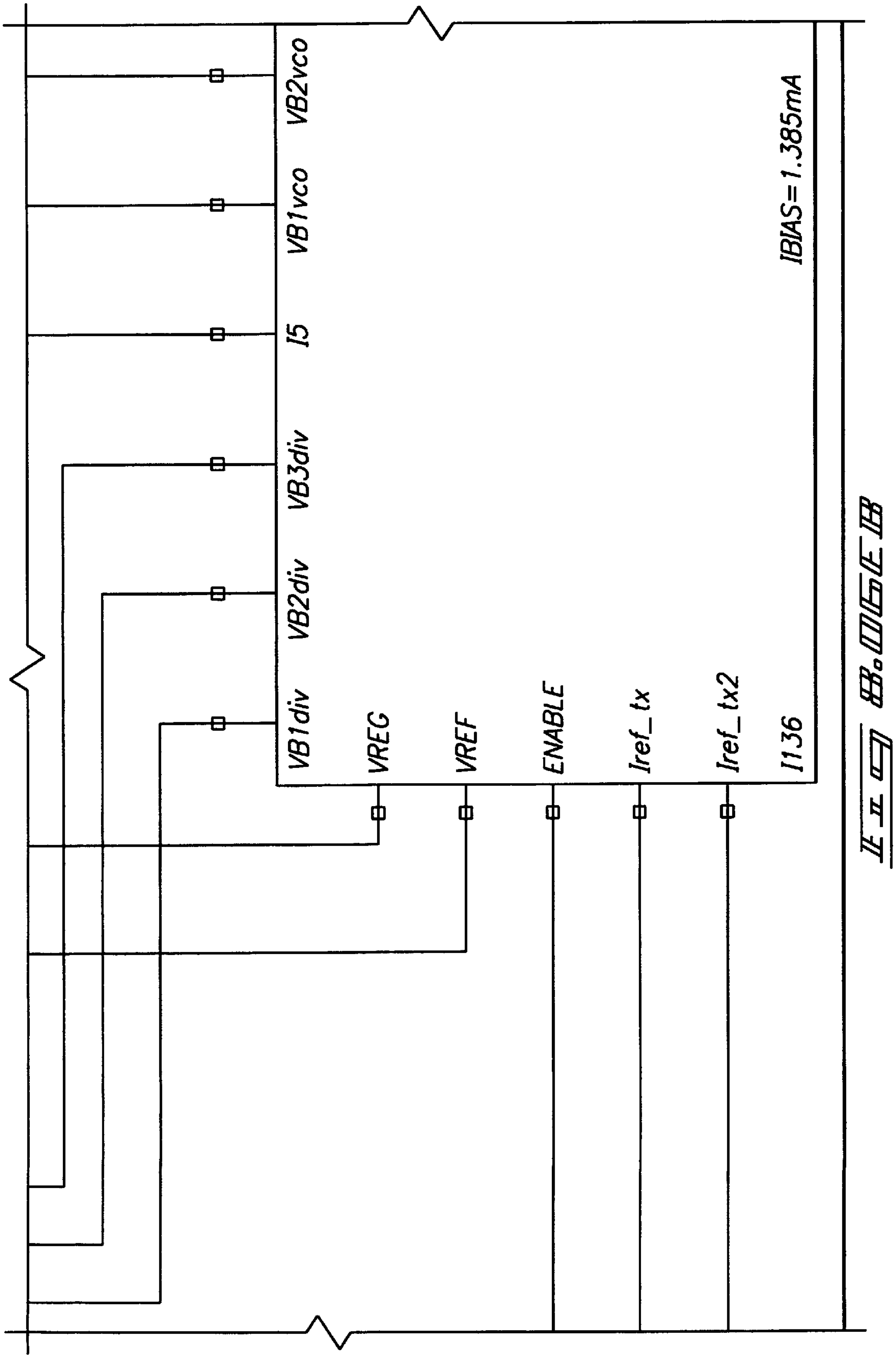
Fig. 8.006EB

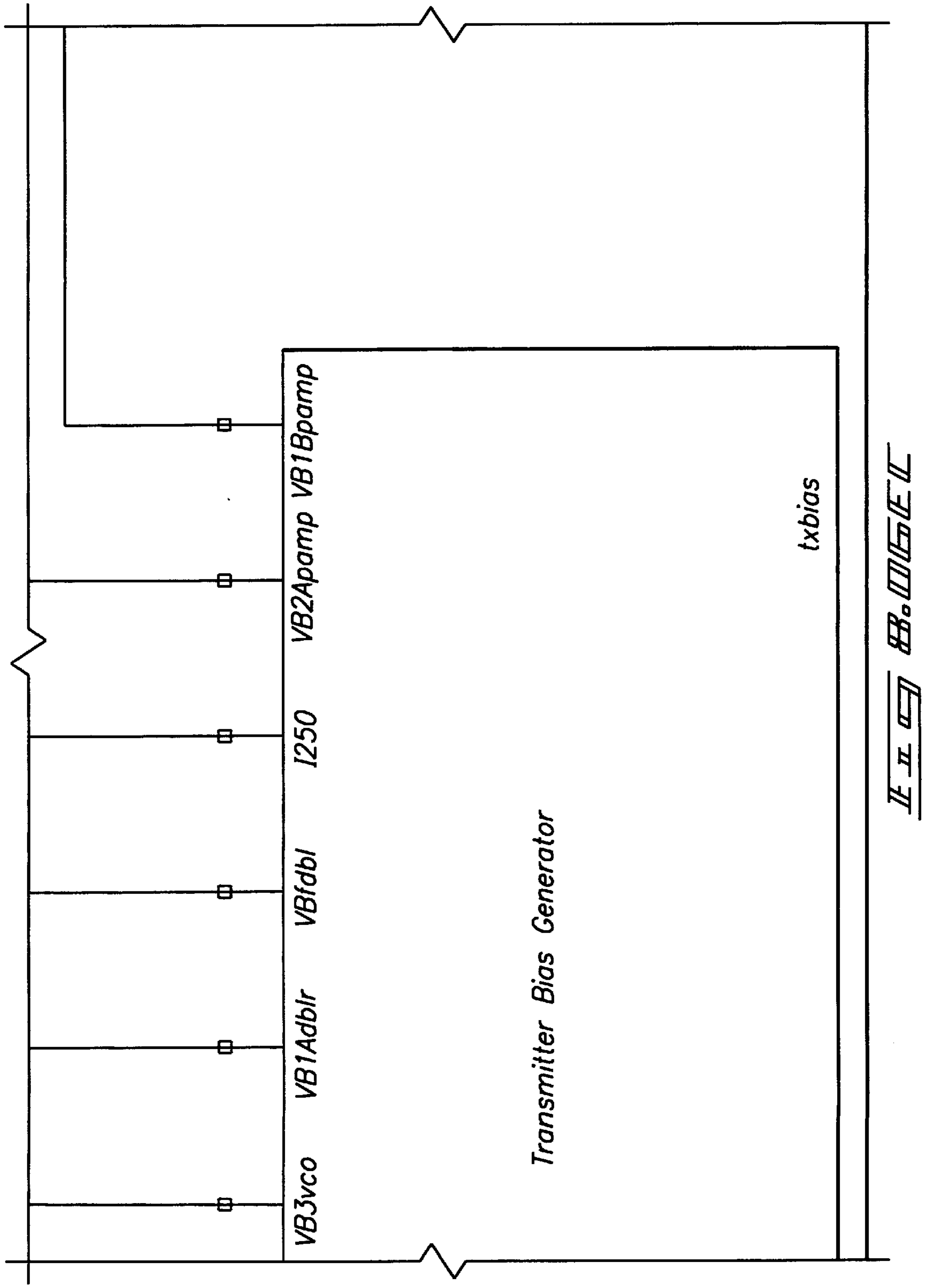
FIG. 8.06EL

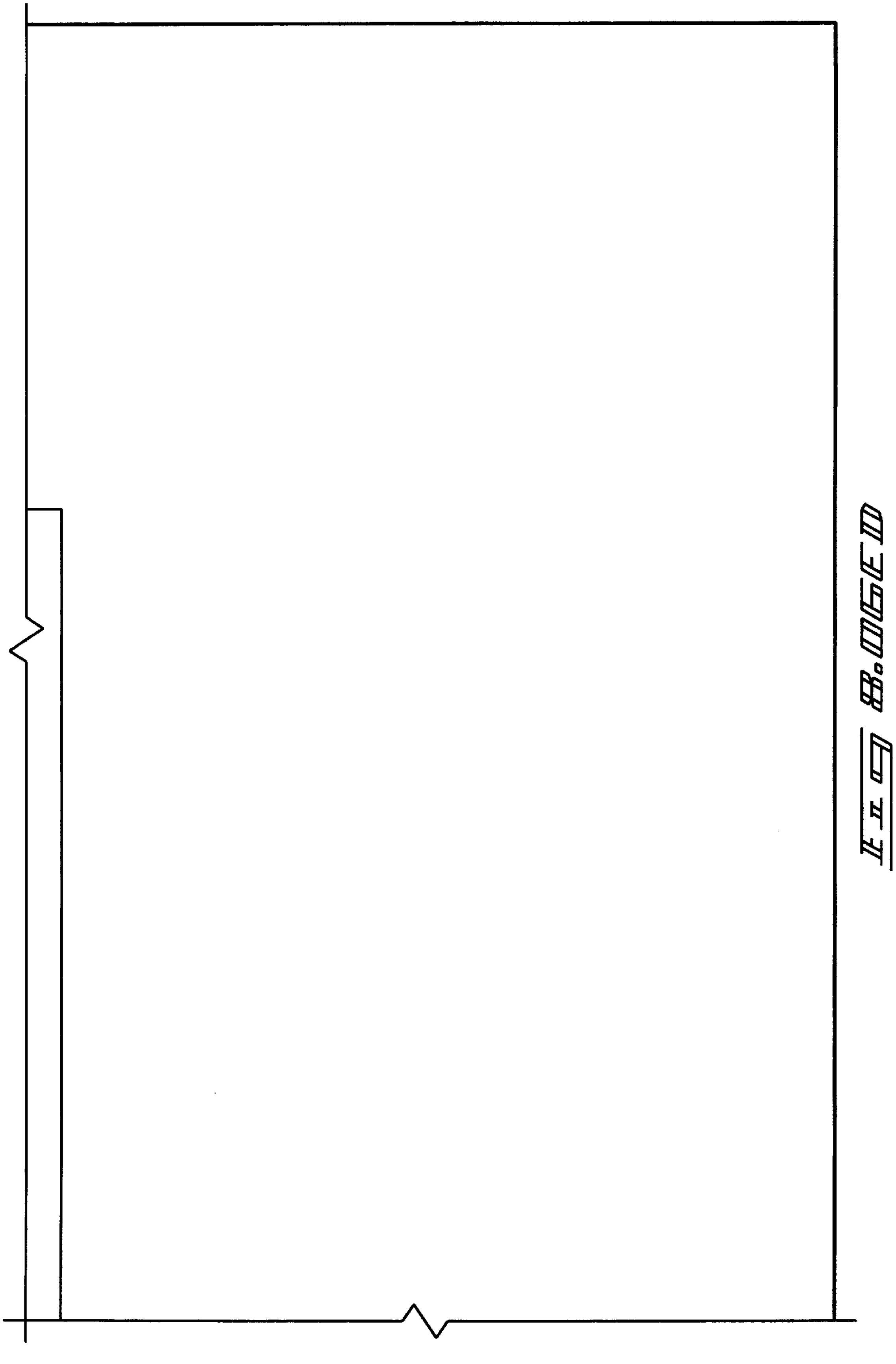
Fig. 8.06ED

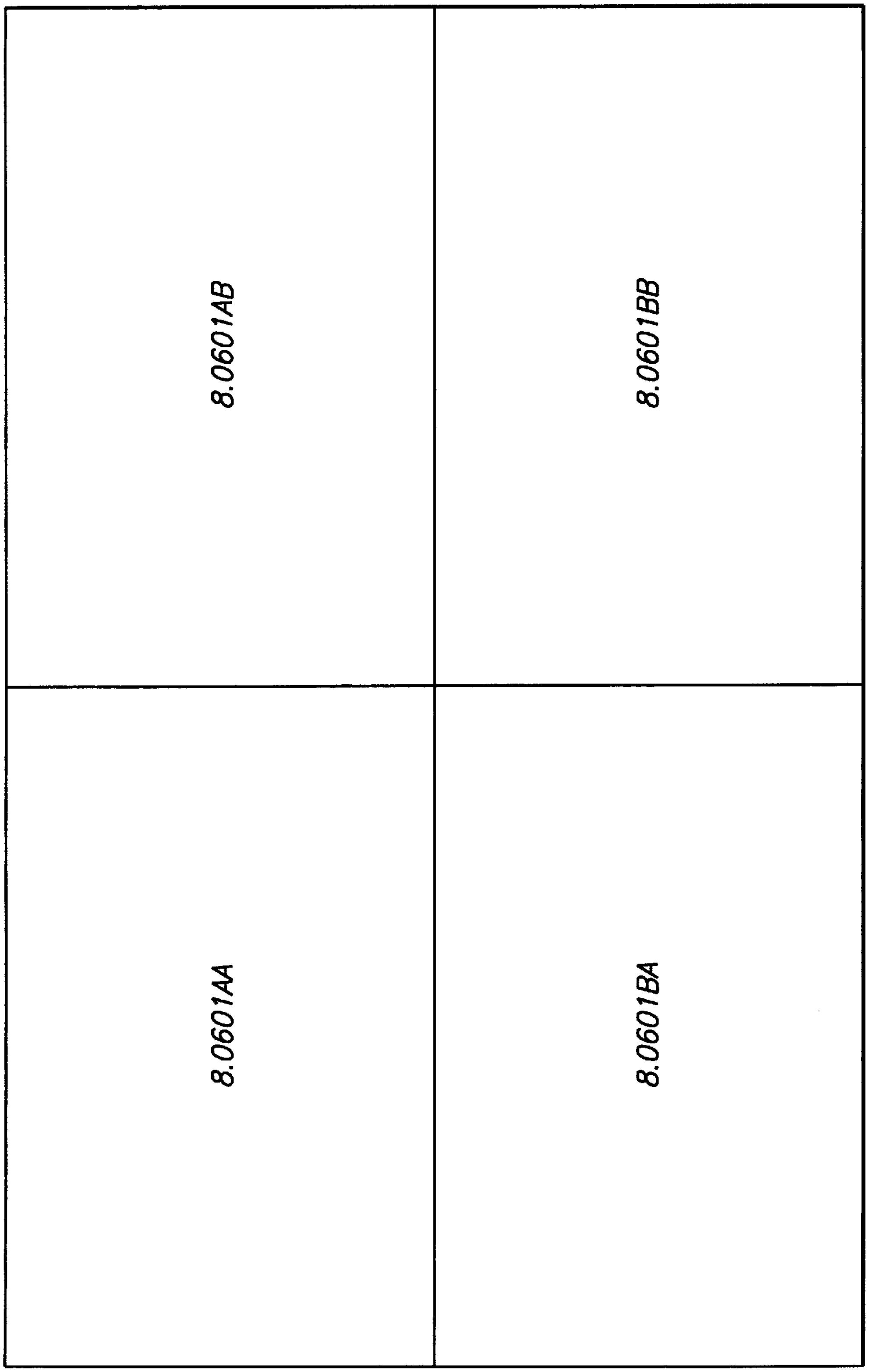
Fig. 8.0601

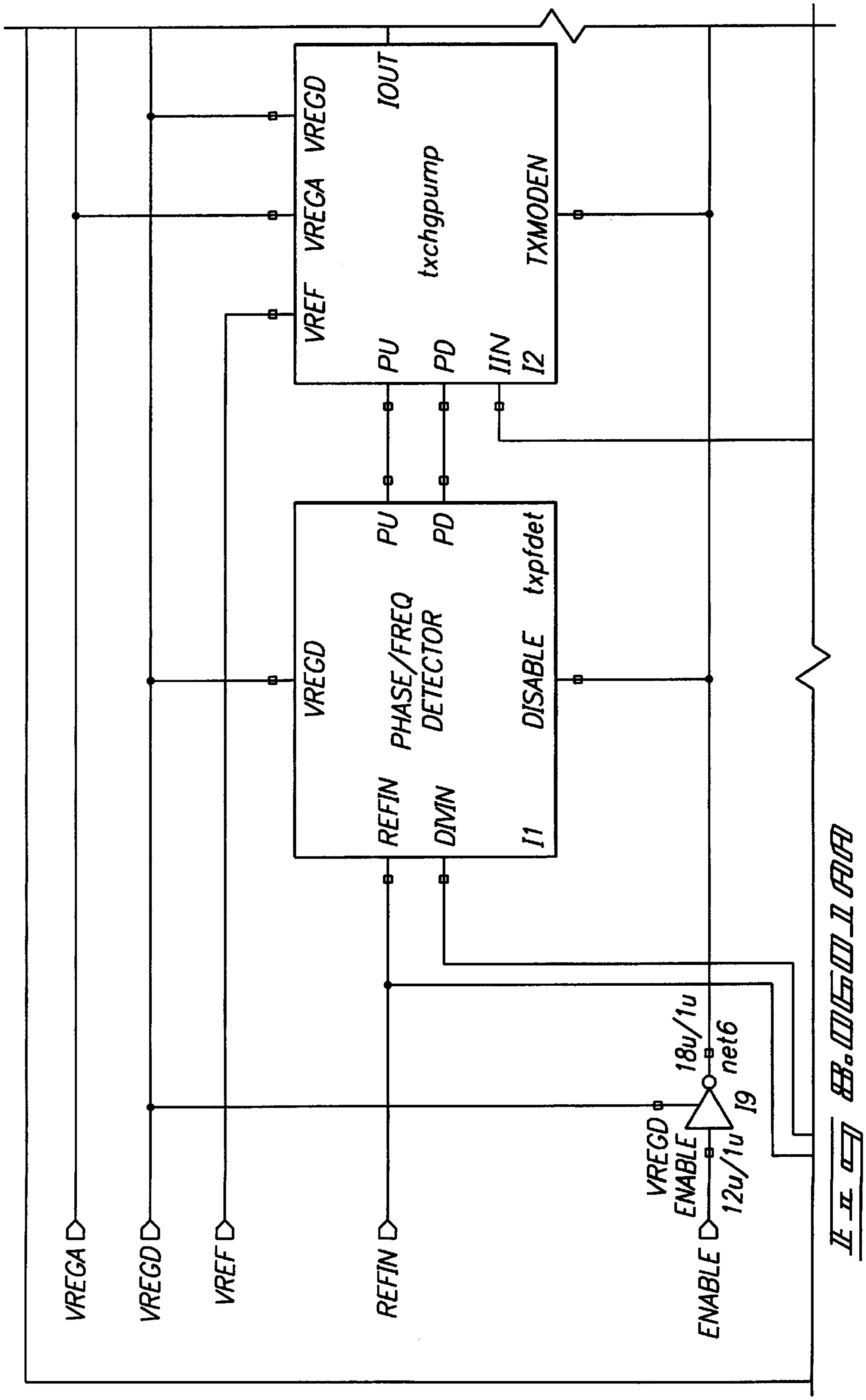
Fig. 8.0601AA

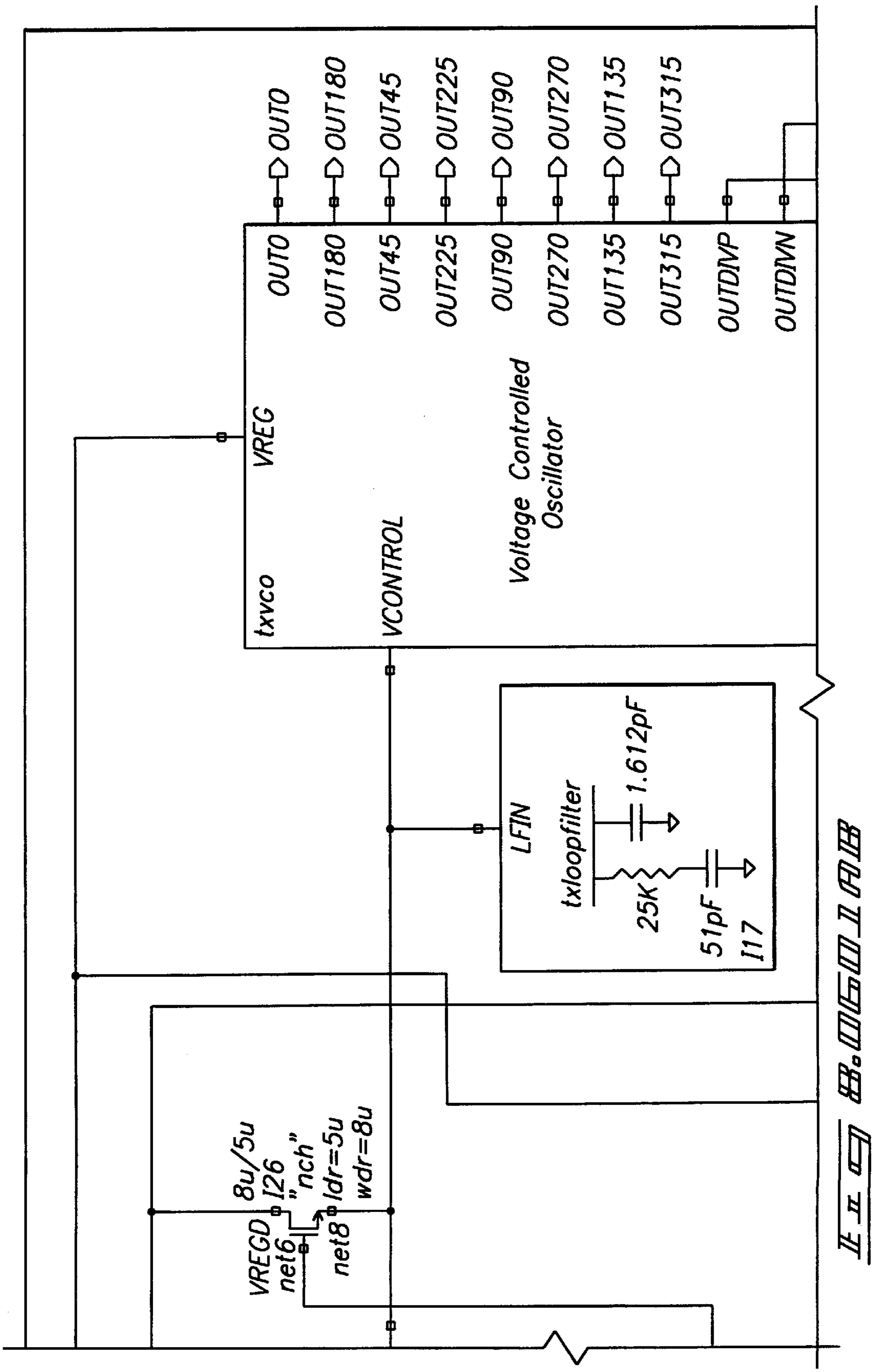
Fig. 8.0601AB

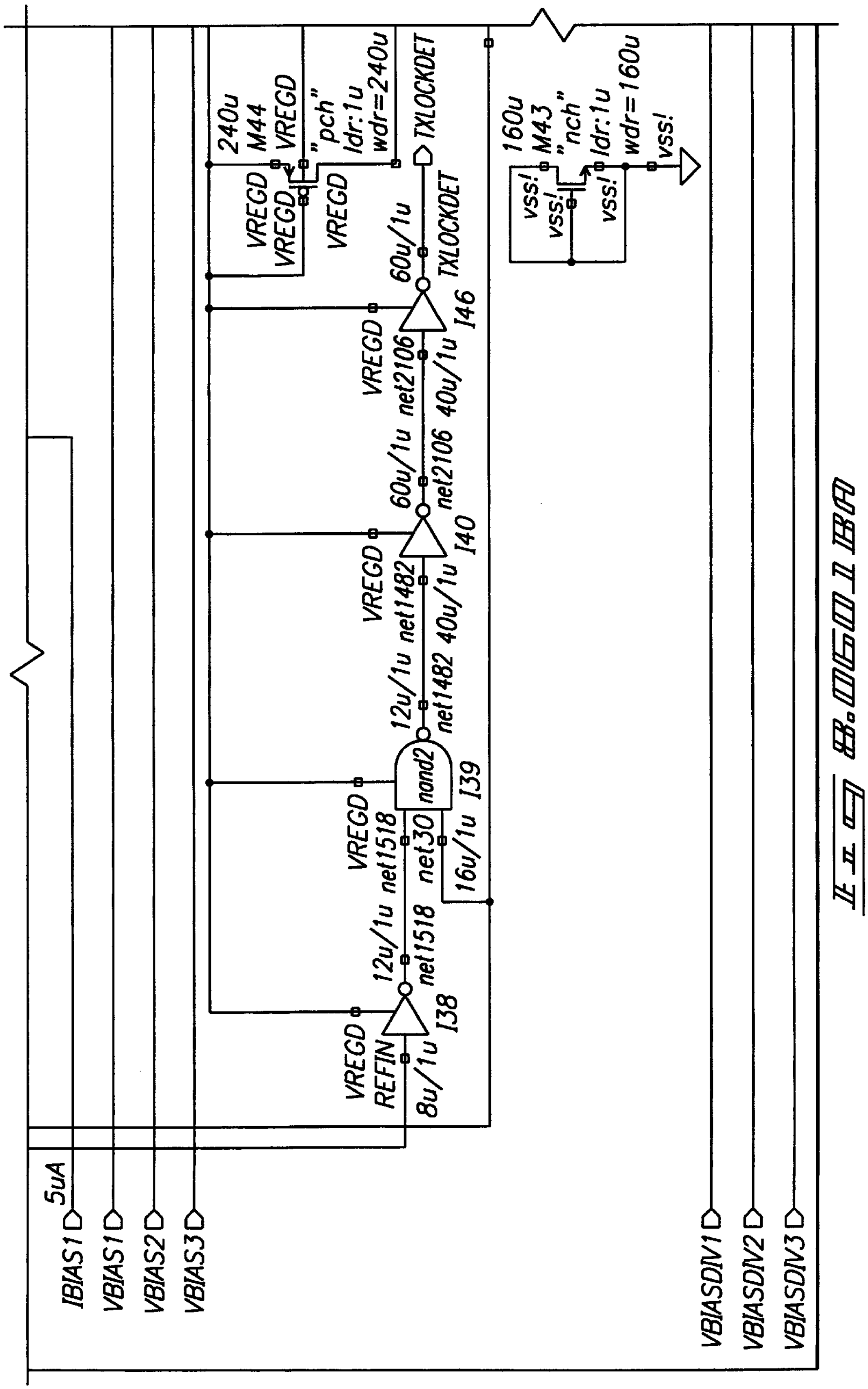
FIG. 8.0G1BA

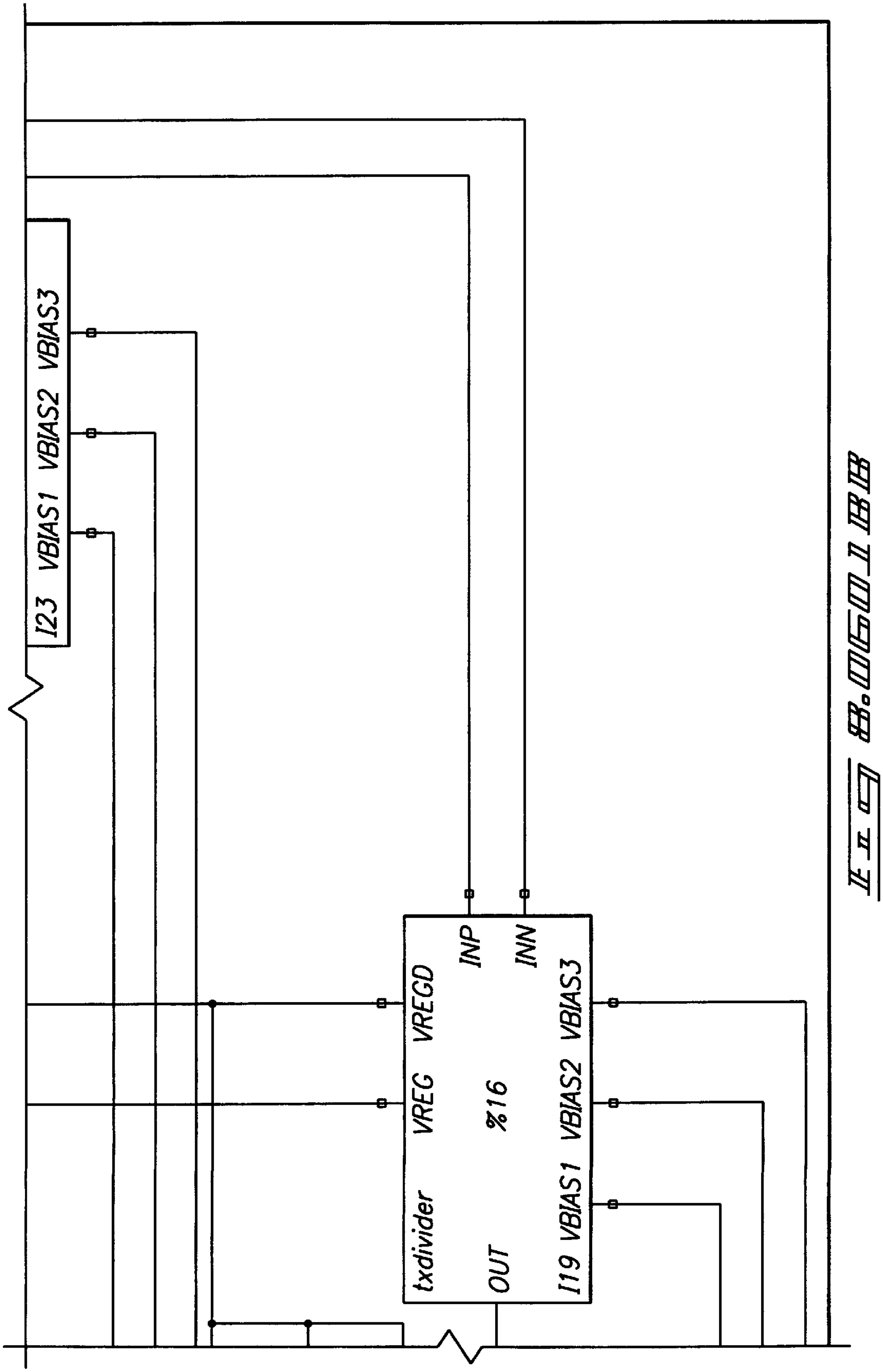
FIG. 8.060_1B

| | | |
|---|---|---|
| 8.060101AA | 8.060101AB | 8.060101AC |
| 8.060101BA | 8.060101BB | 8.060101BC |
| 8.060101CA | 8.060101CB | 8.060101CC |

Fig. 8.060101

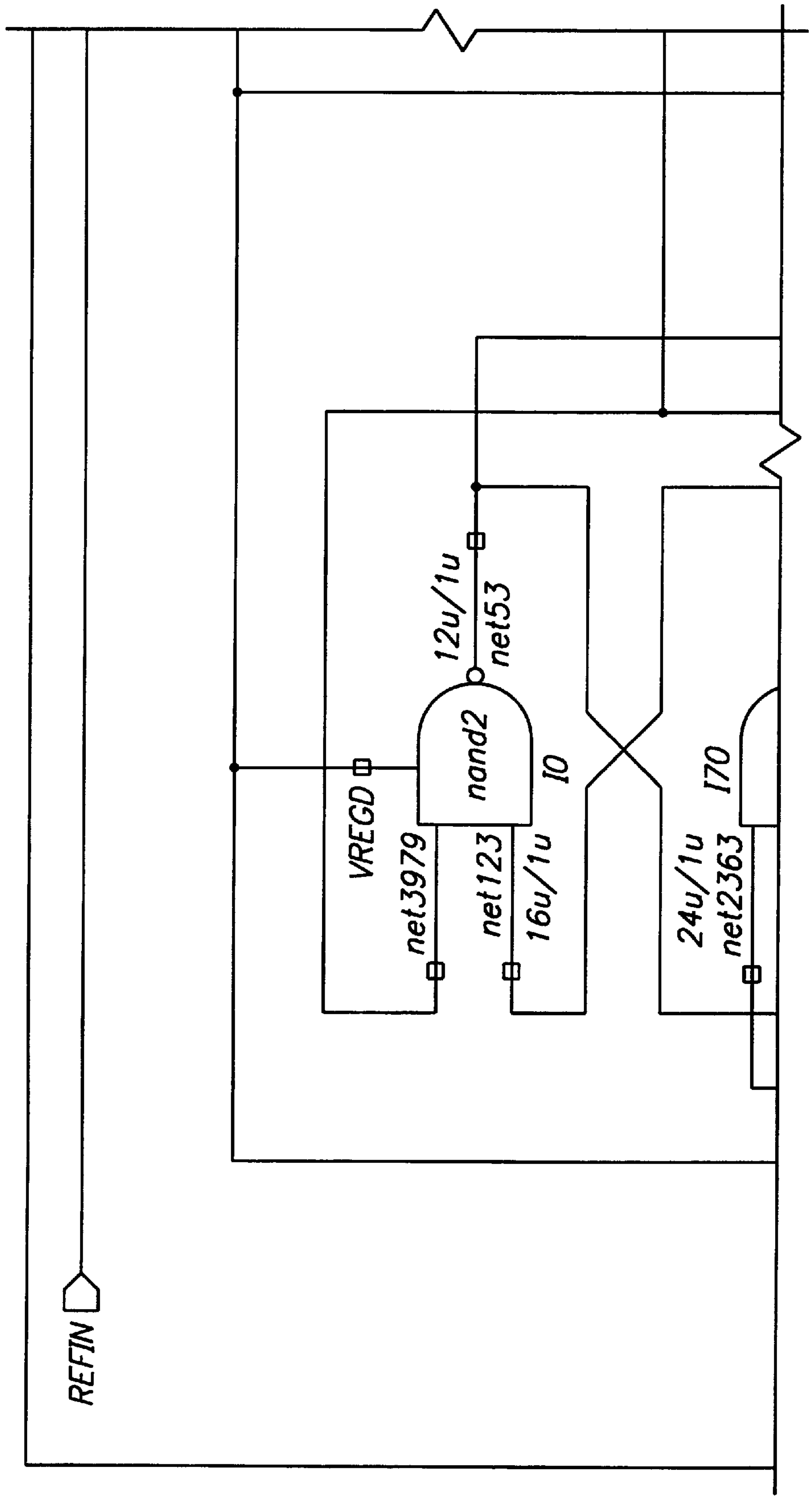
FIG. 8.06G0_11AA

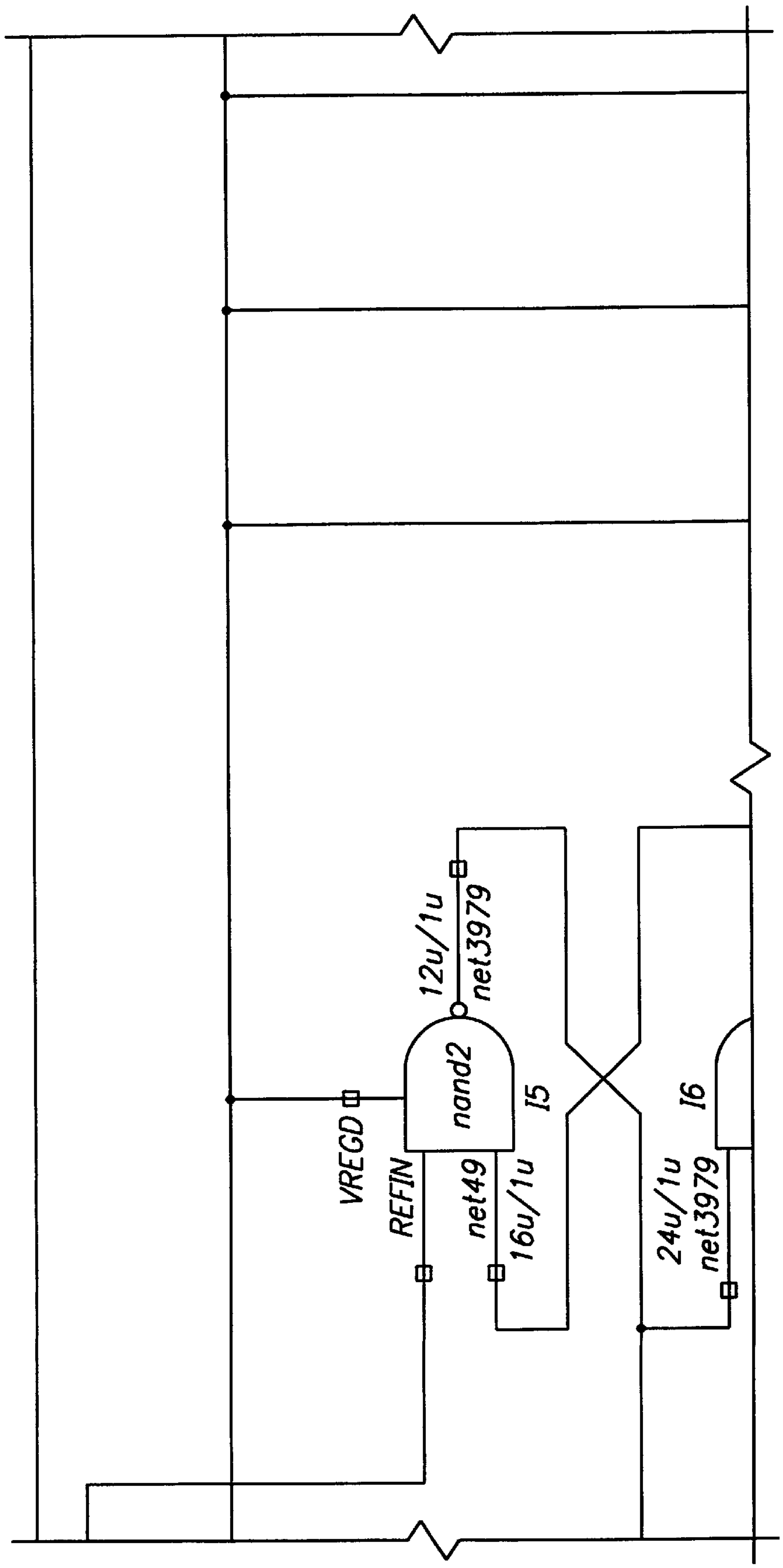
Fig. 8.0G0101AB

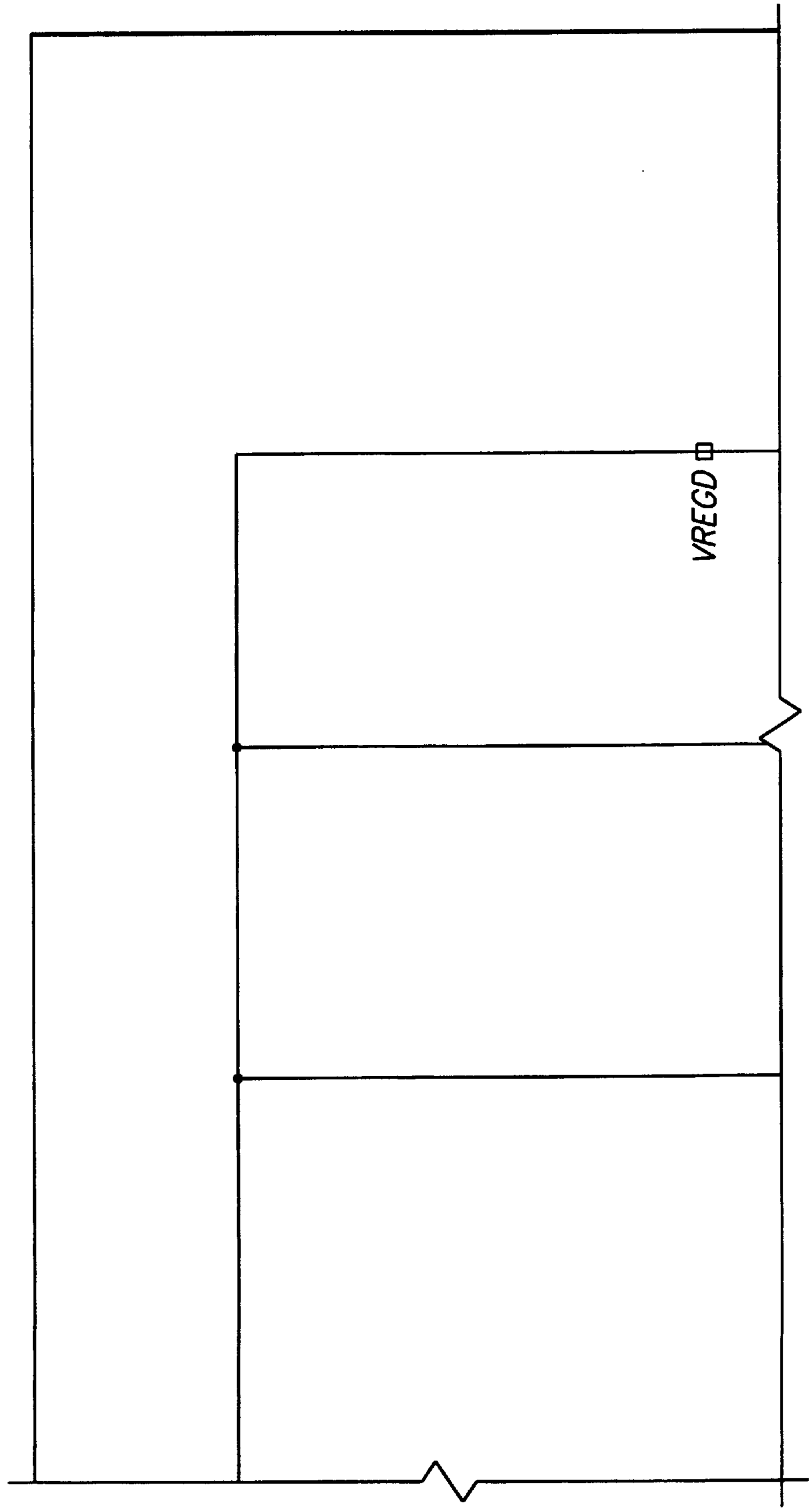
FIG. 8.060101AC

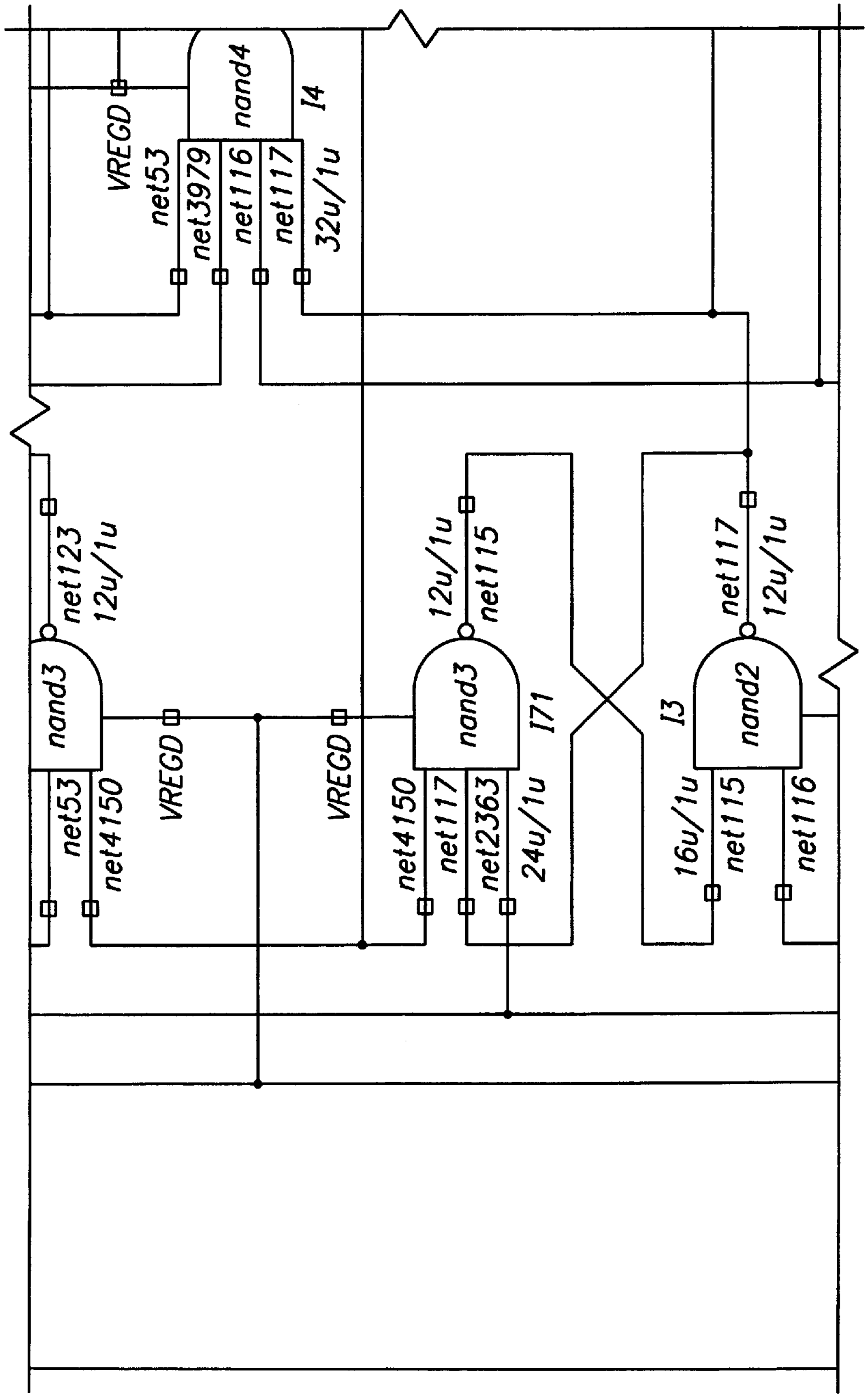
Fig 8.0601011BA

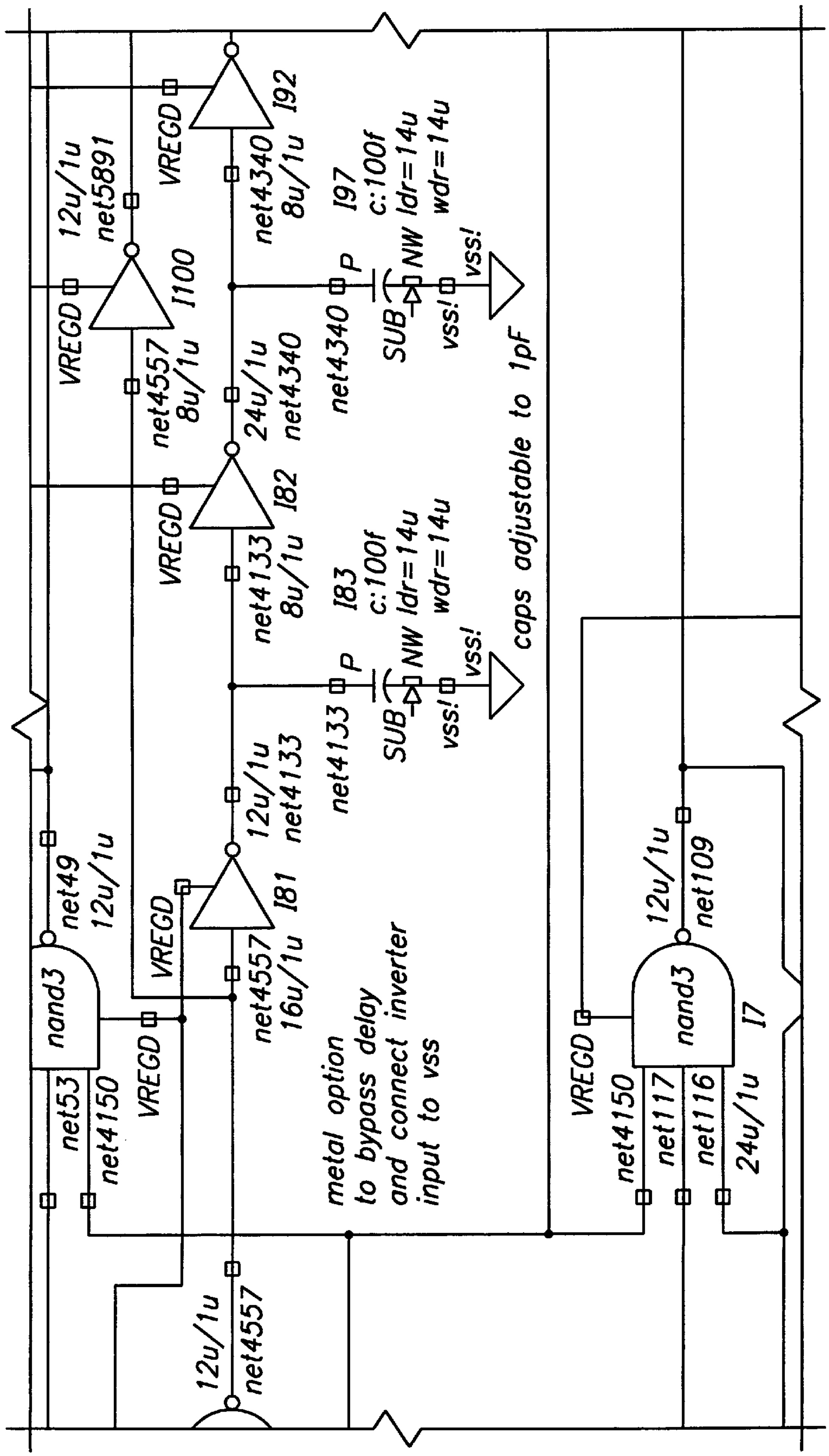
FIG. 8.0601.1BB

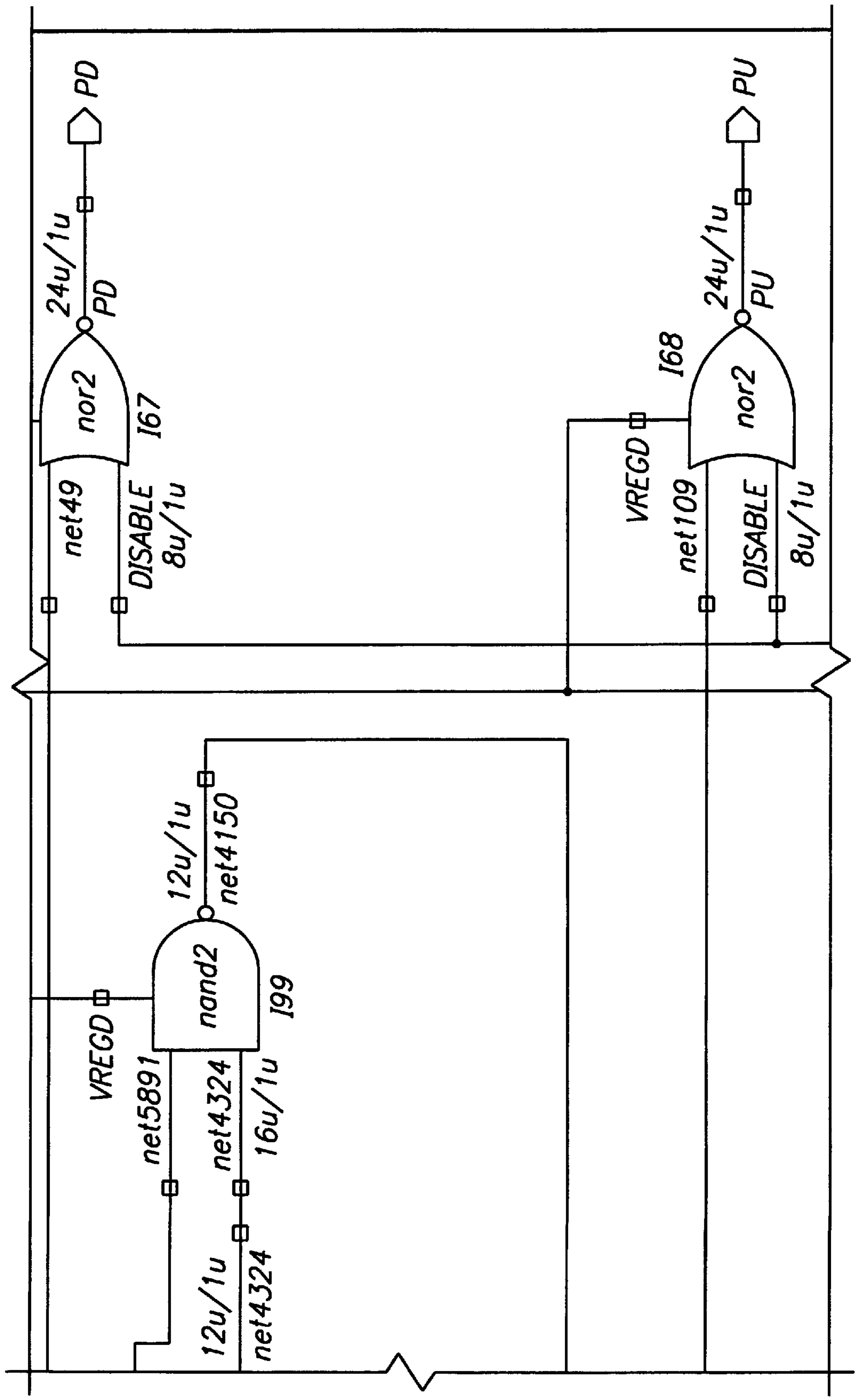
Fig 8.060101BC

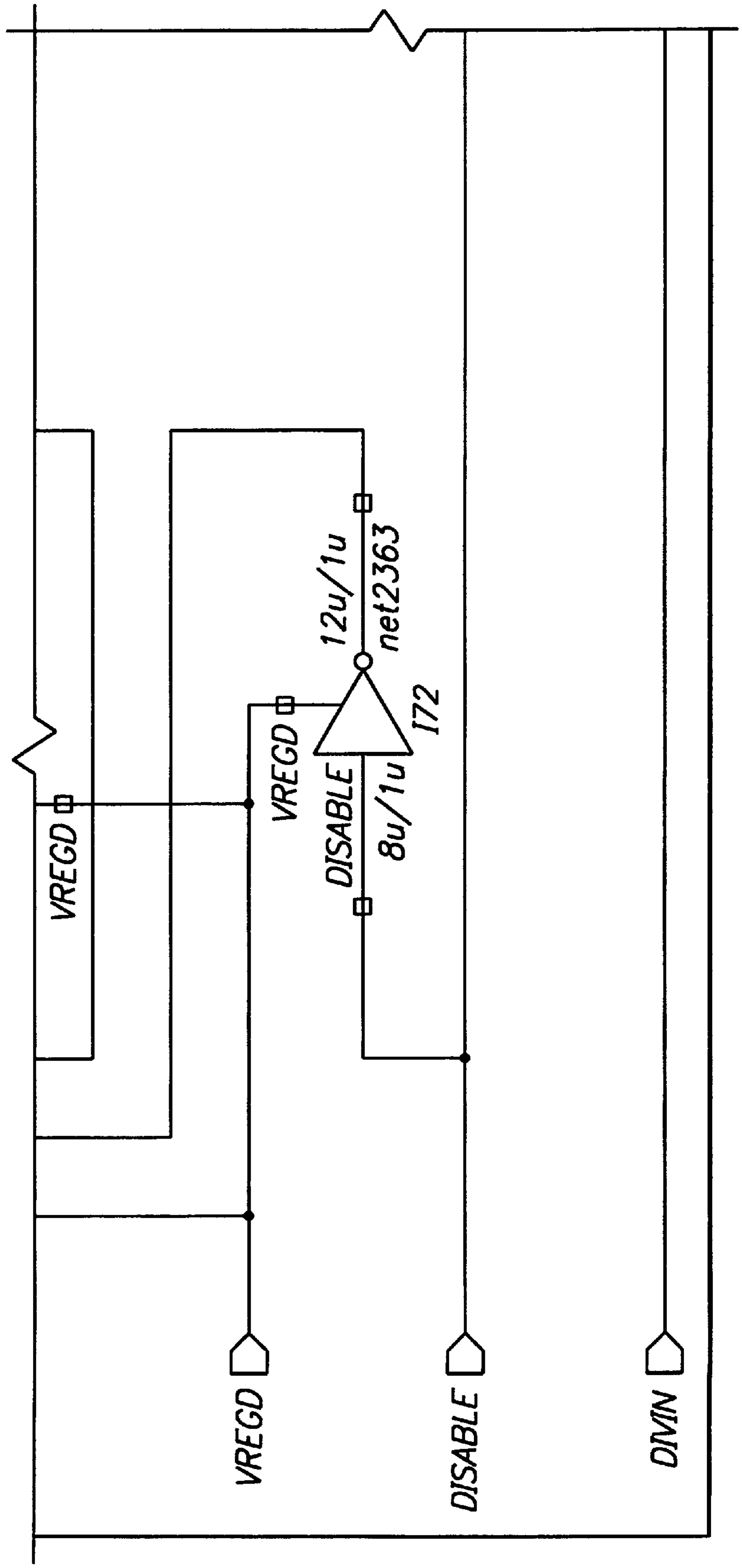
12u/1u
net2363
VREGD
I72
DISABLE
8u/1u
VREGD
VREGD
DISABLE
DIVIN

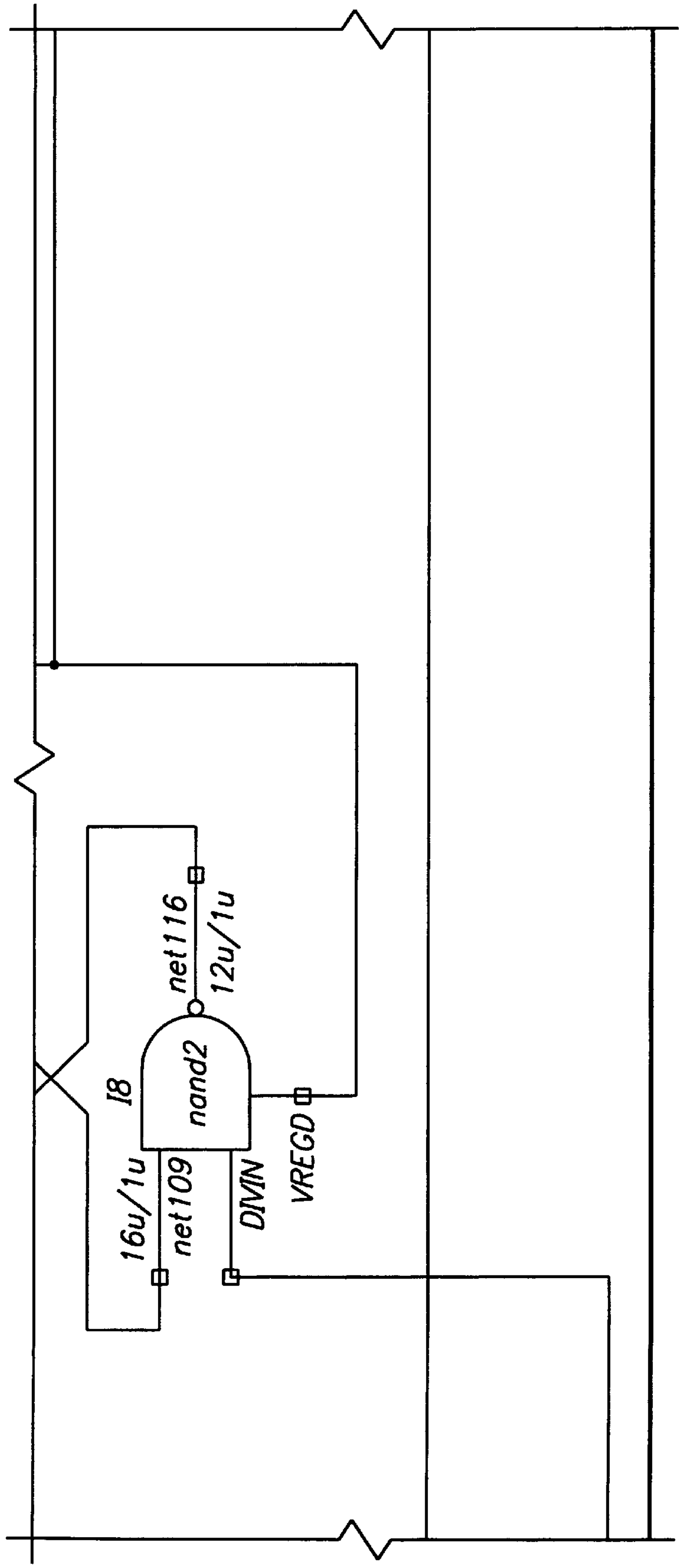
Fig. 8.06010.1CB

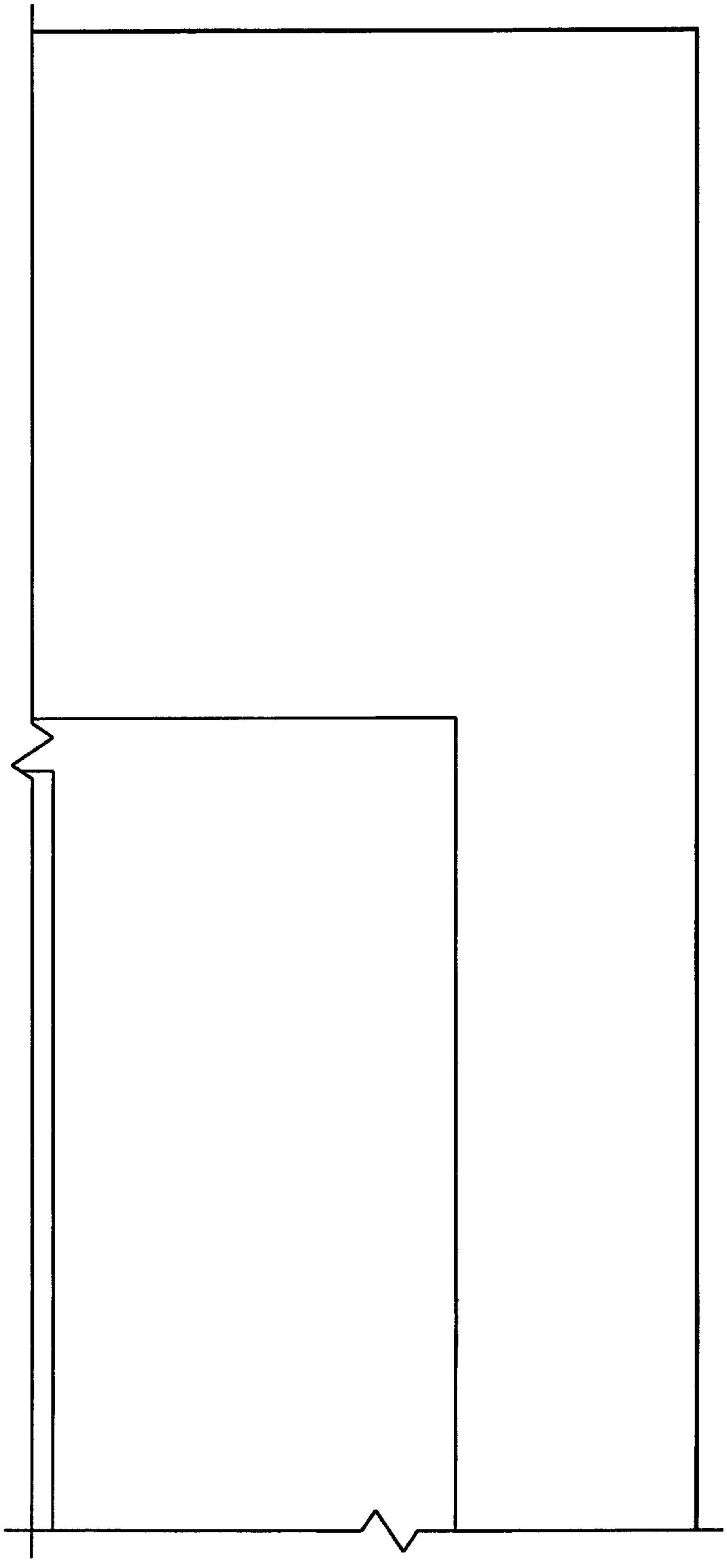
FIG. 8.060101CC

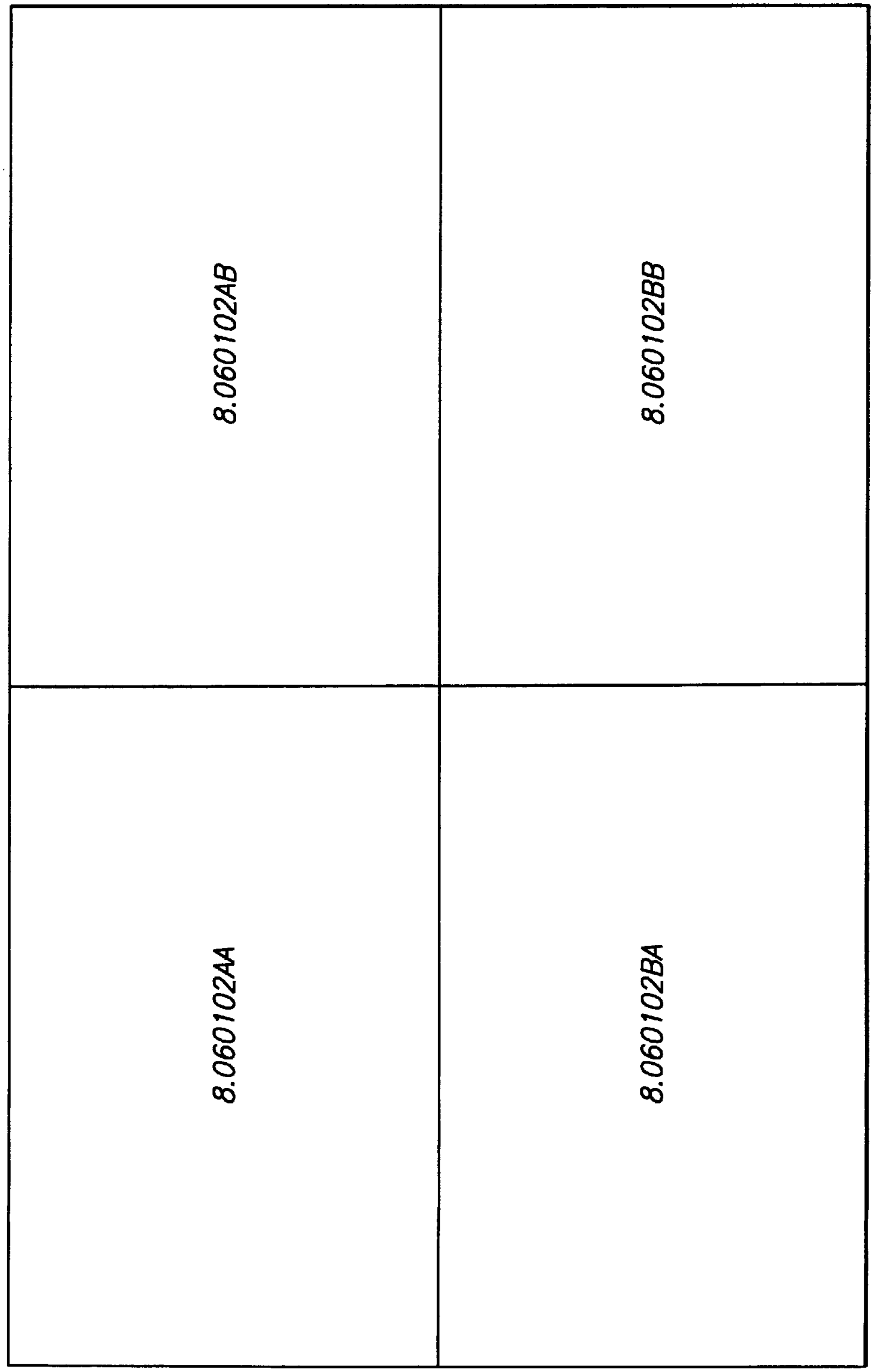
FIG. 8.060102

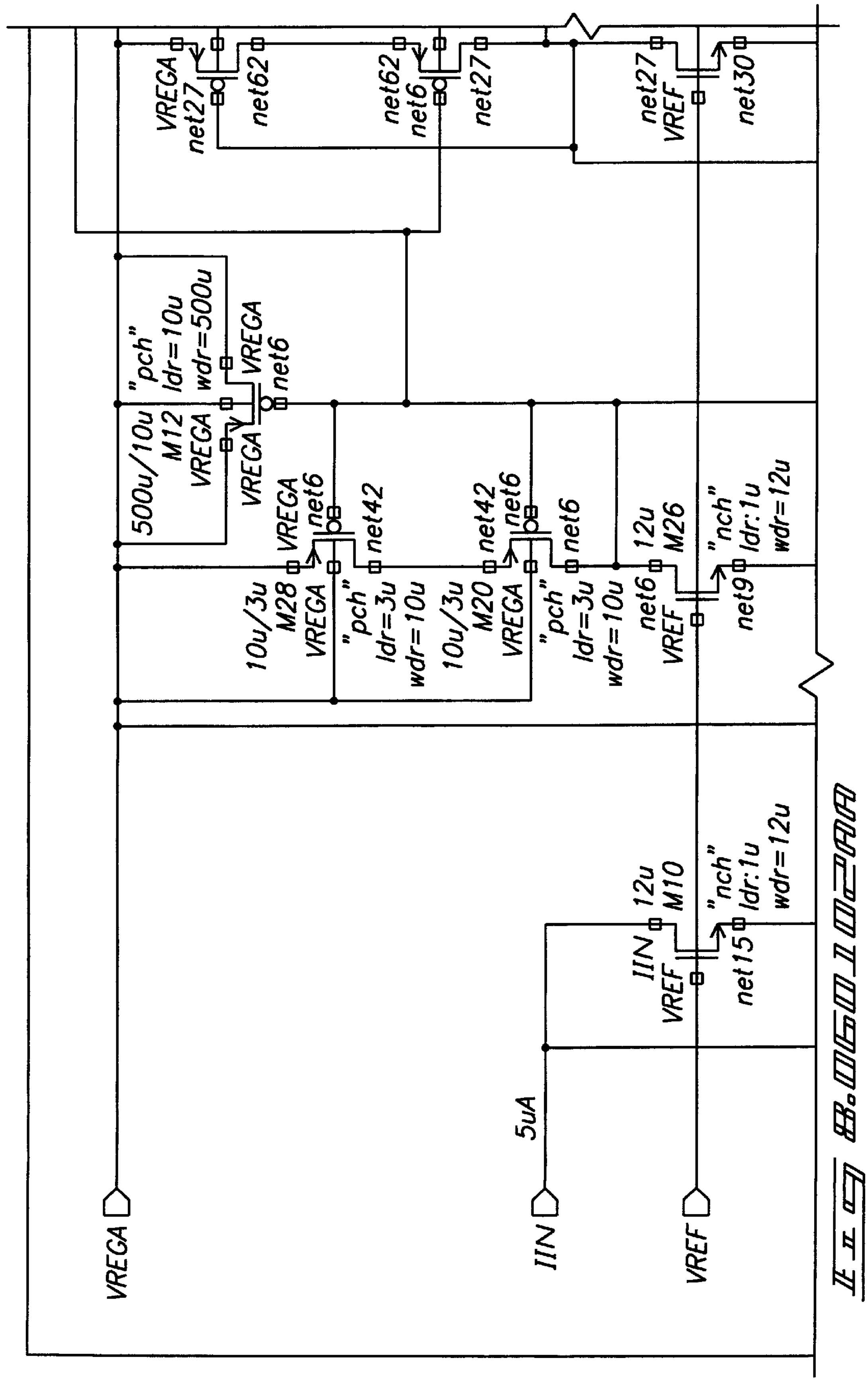
VREGA
net27
net62
net6
VREF
net30
"pch"
ldr=10u
wdr=500u
500u/10u
M12
net42
10u/3u
M28
M20
"pch"
ldr=3u
wdr=10u
12u
M26
"nch"
ldr:1u
wdr=12u
net9
M10
IIN
net15
5uA
VREF

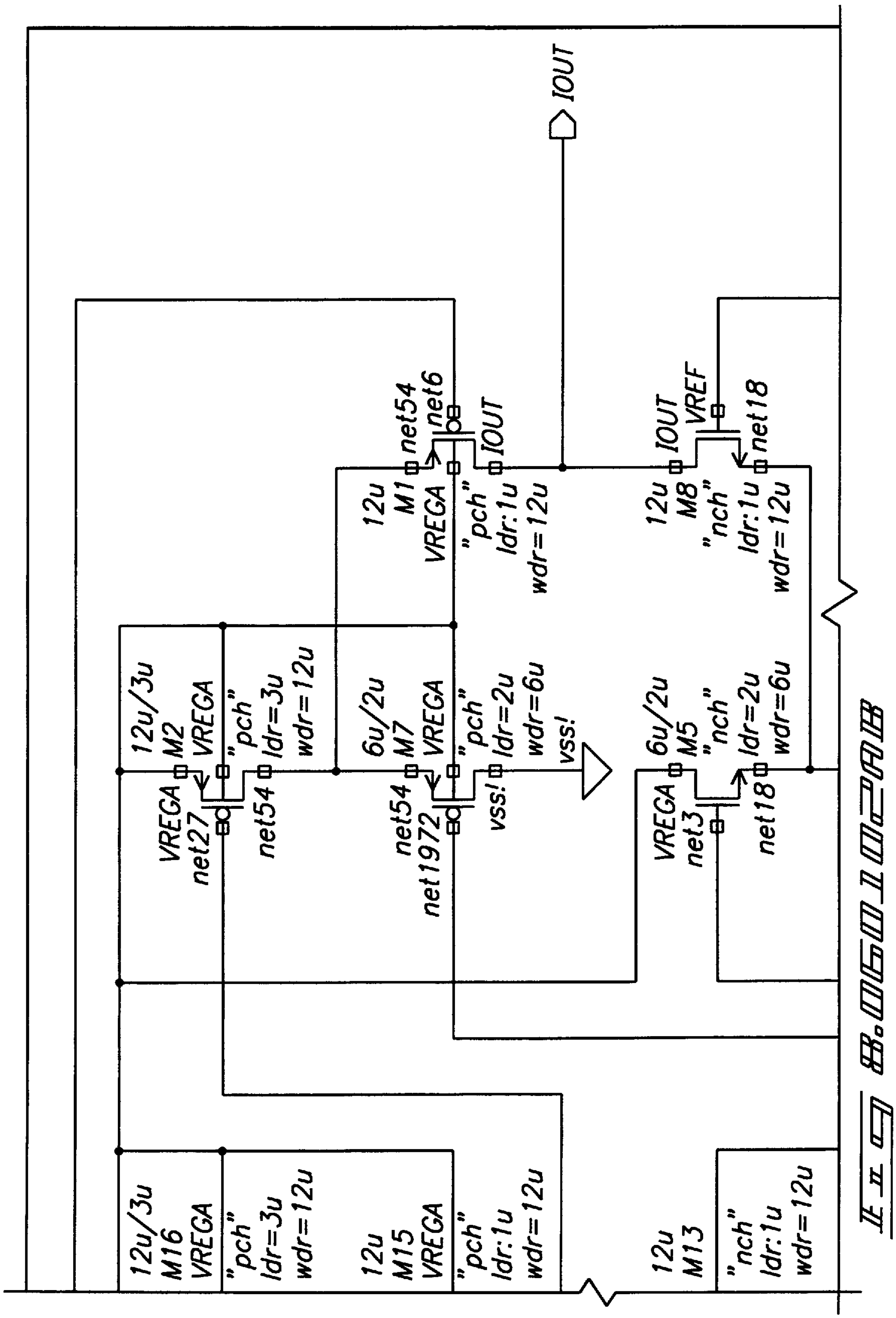
Fig. 8.0060102AB

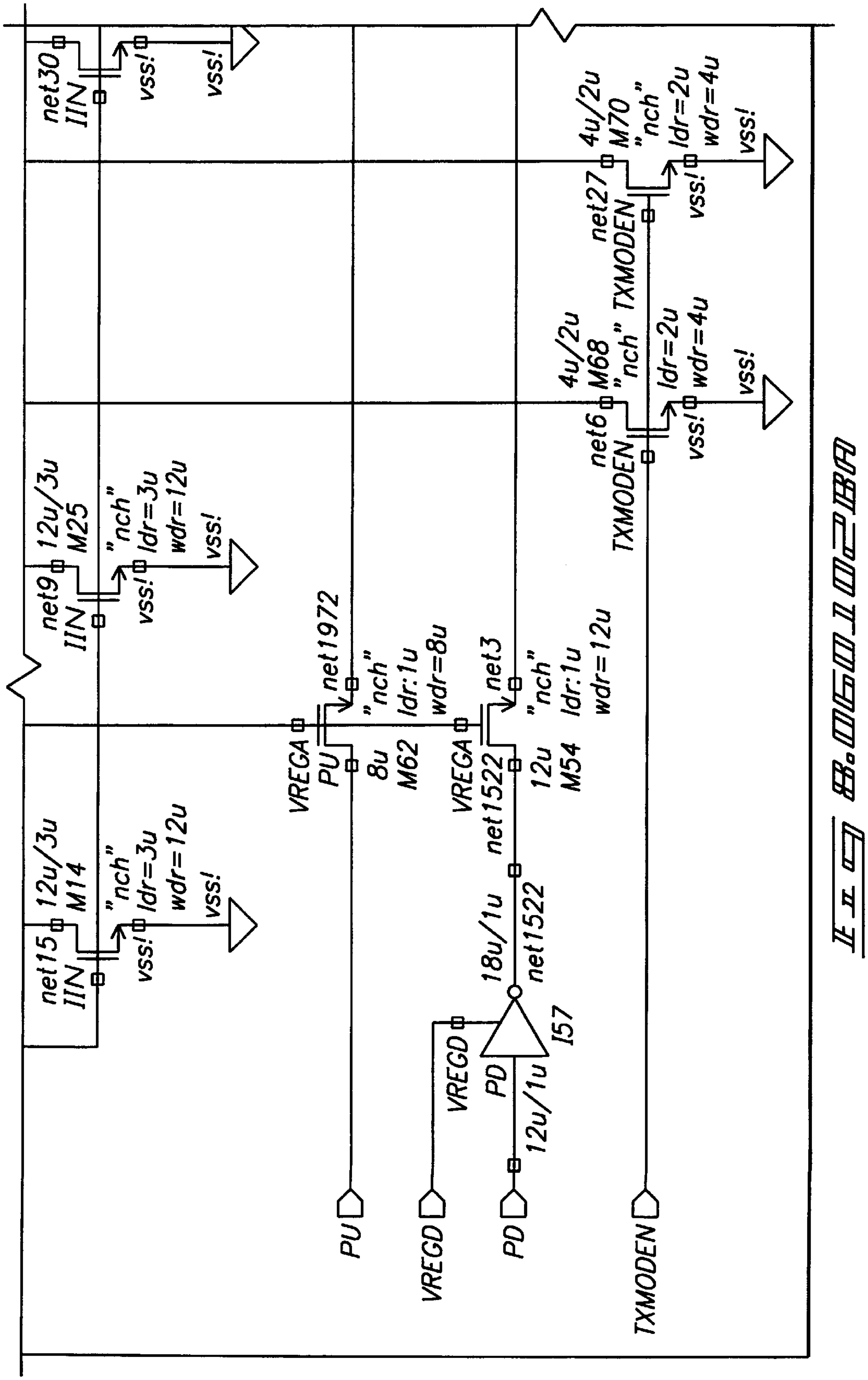
FIG. 8.060102BA

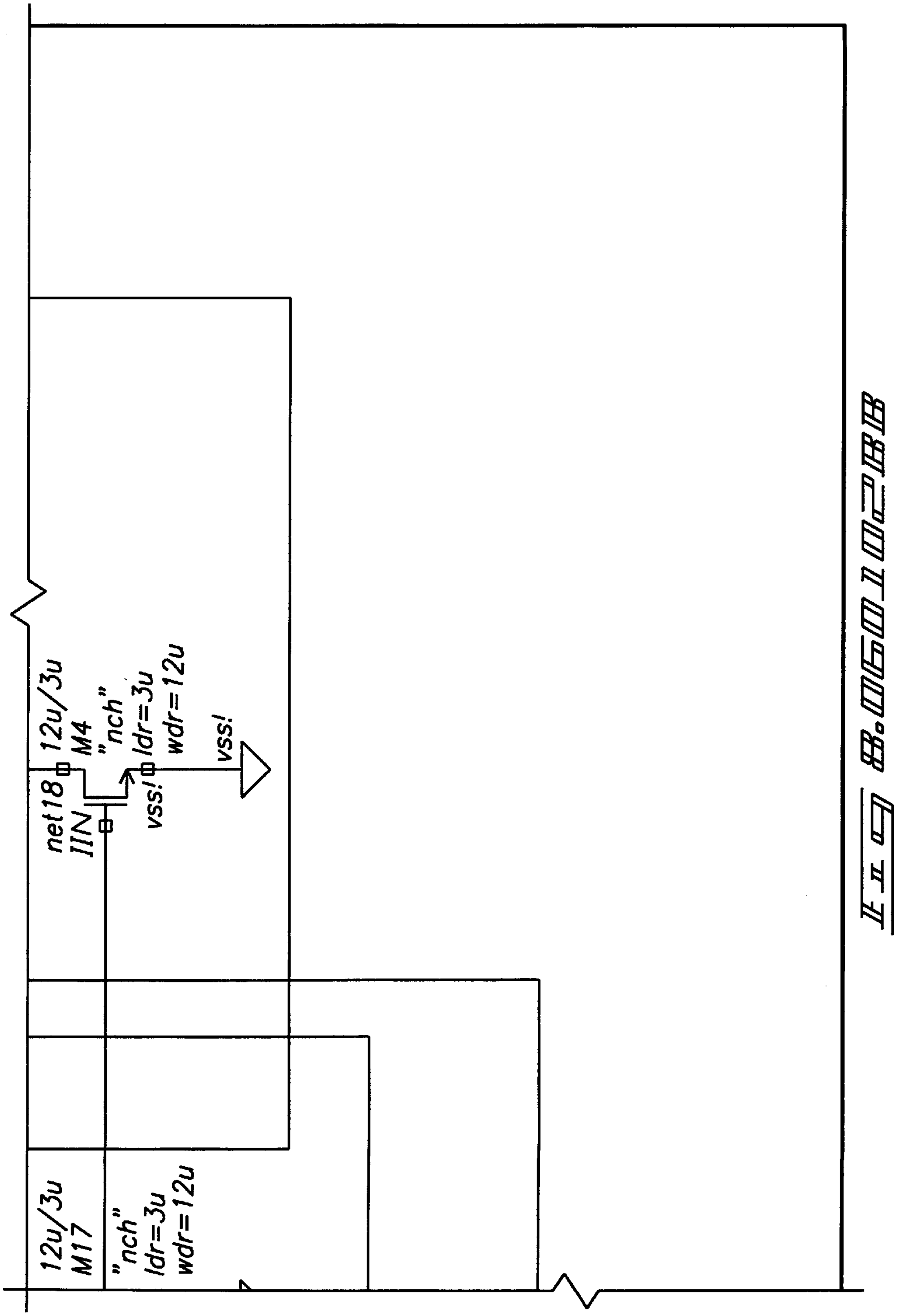
FIG. 8.0601.02BB

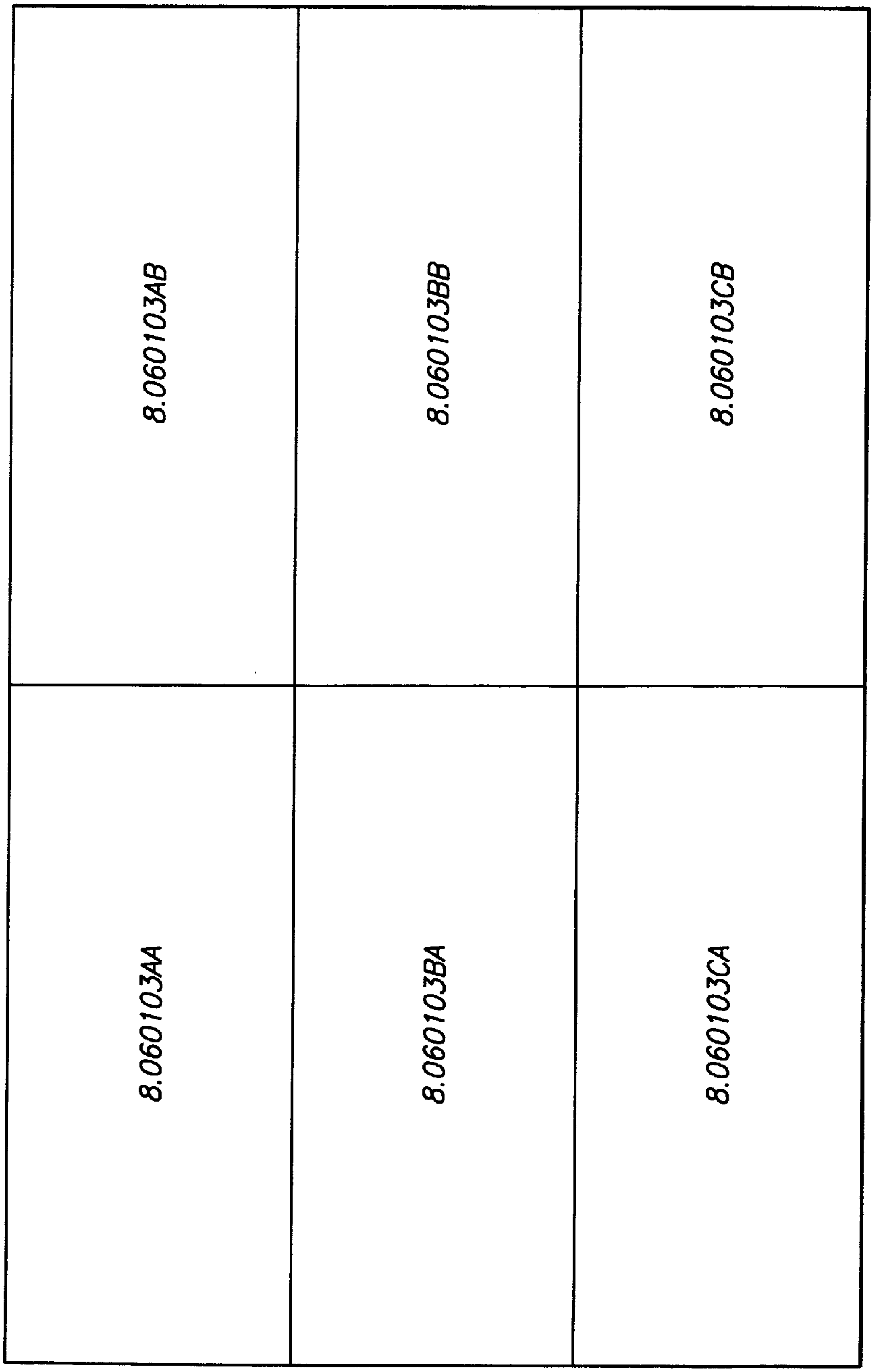
FIG. 8.060103

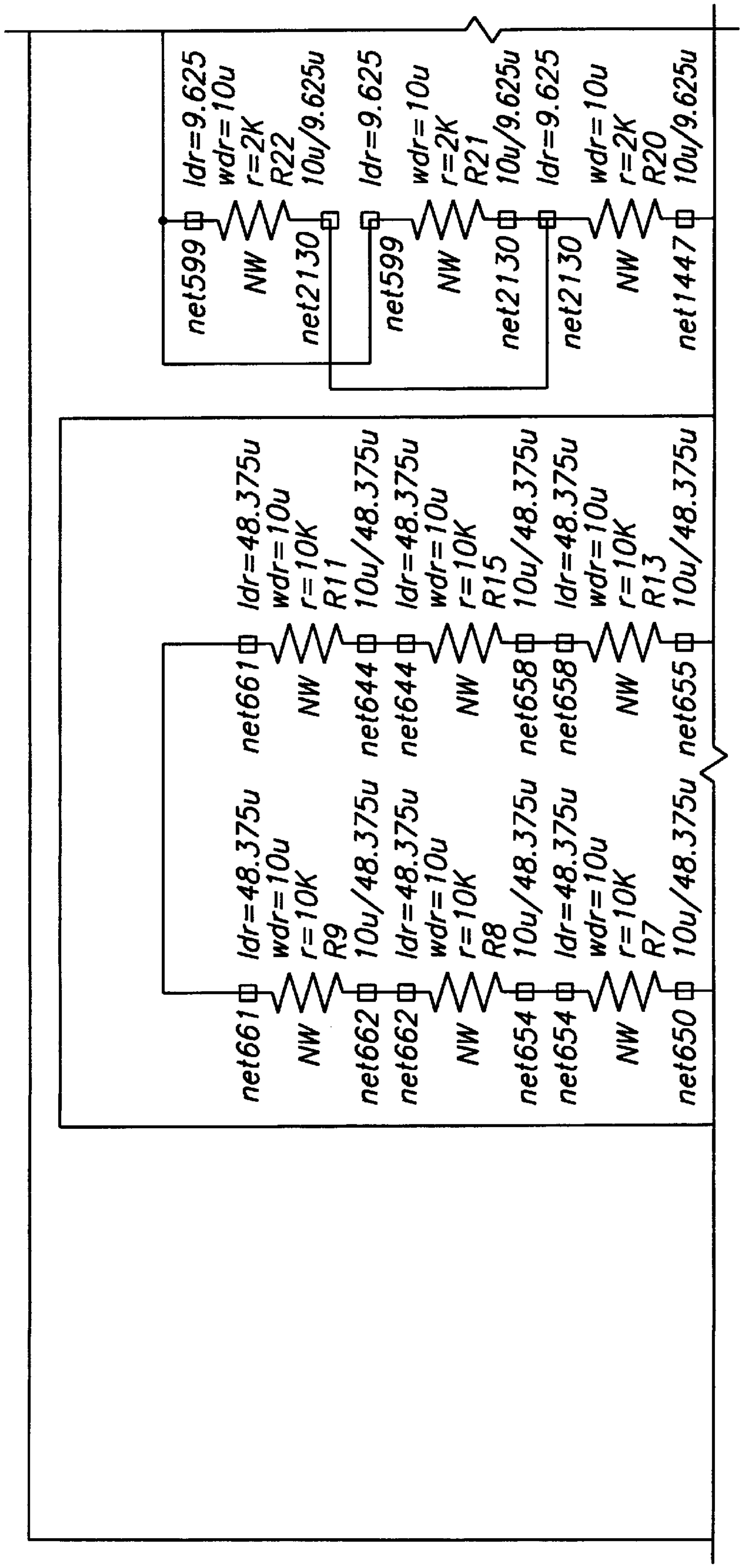
Fig. 8.060103AA

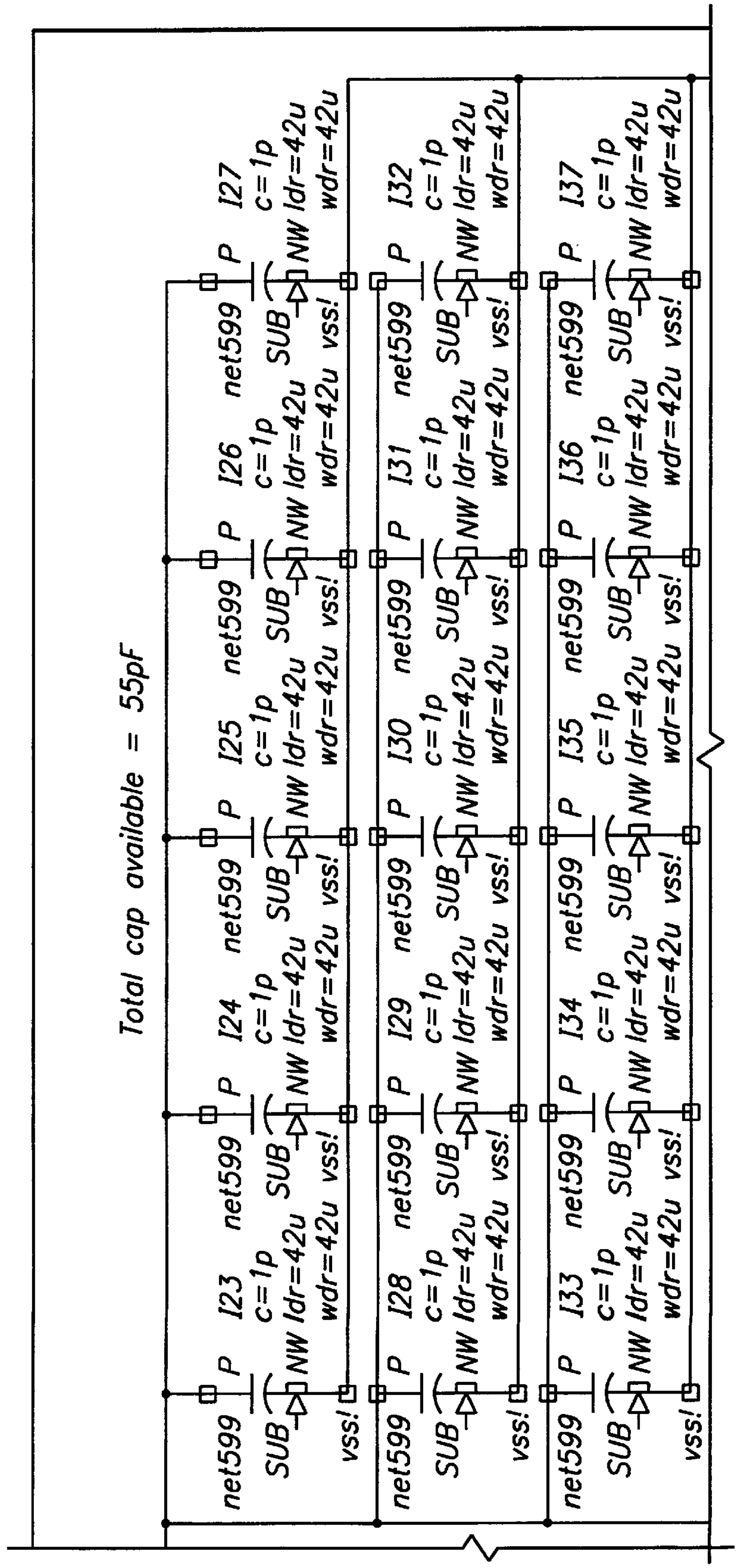
FIG. 8.060103AB

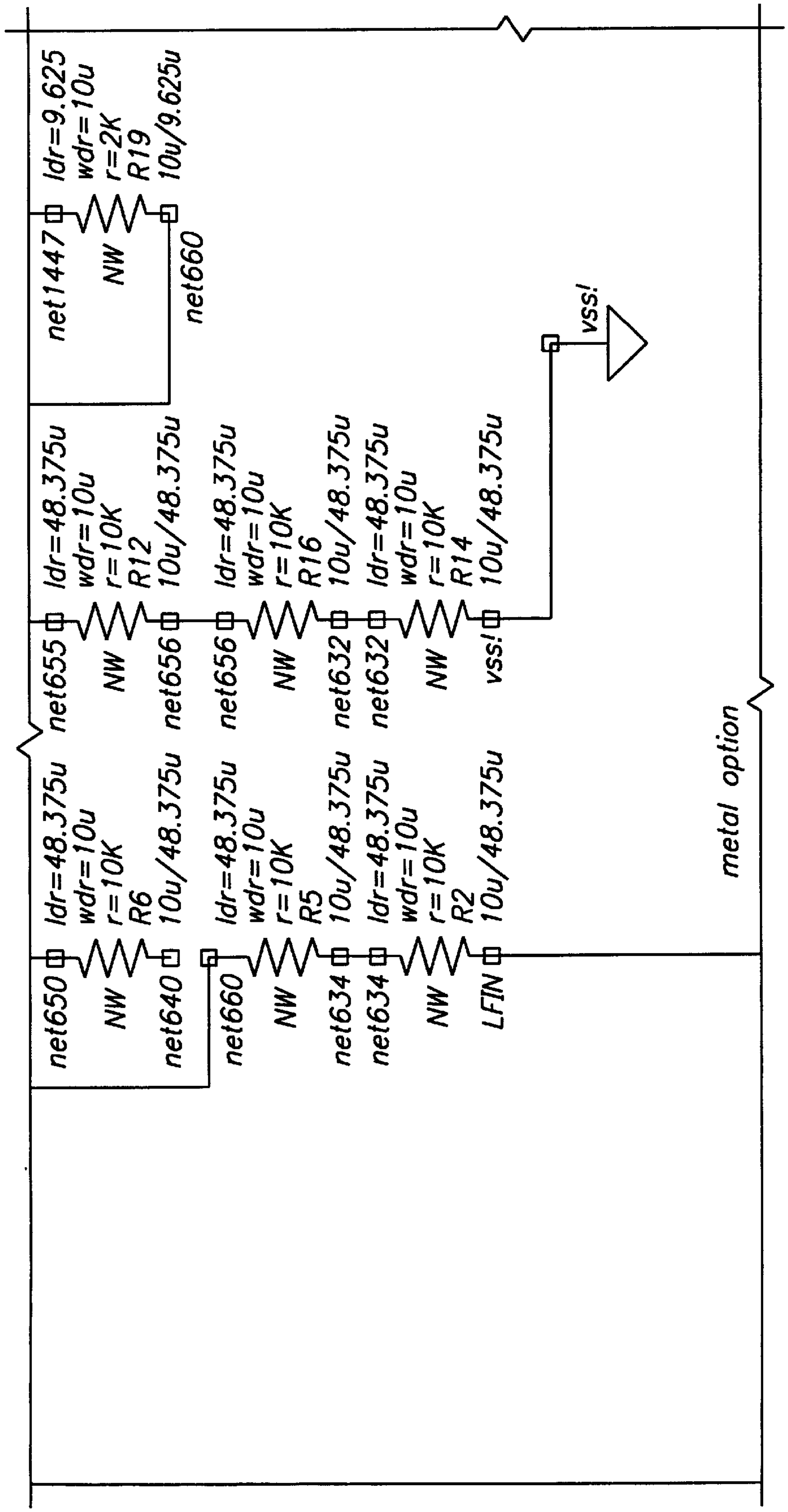
Fig. 8.0G0I0E3BA

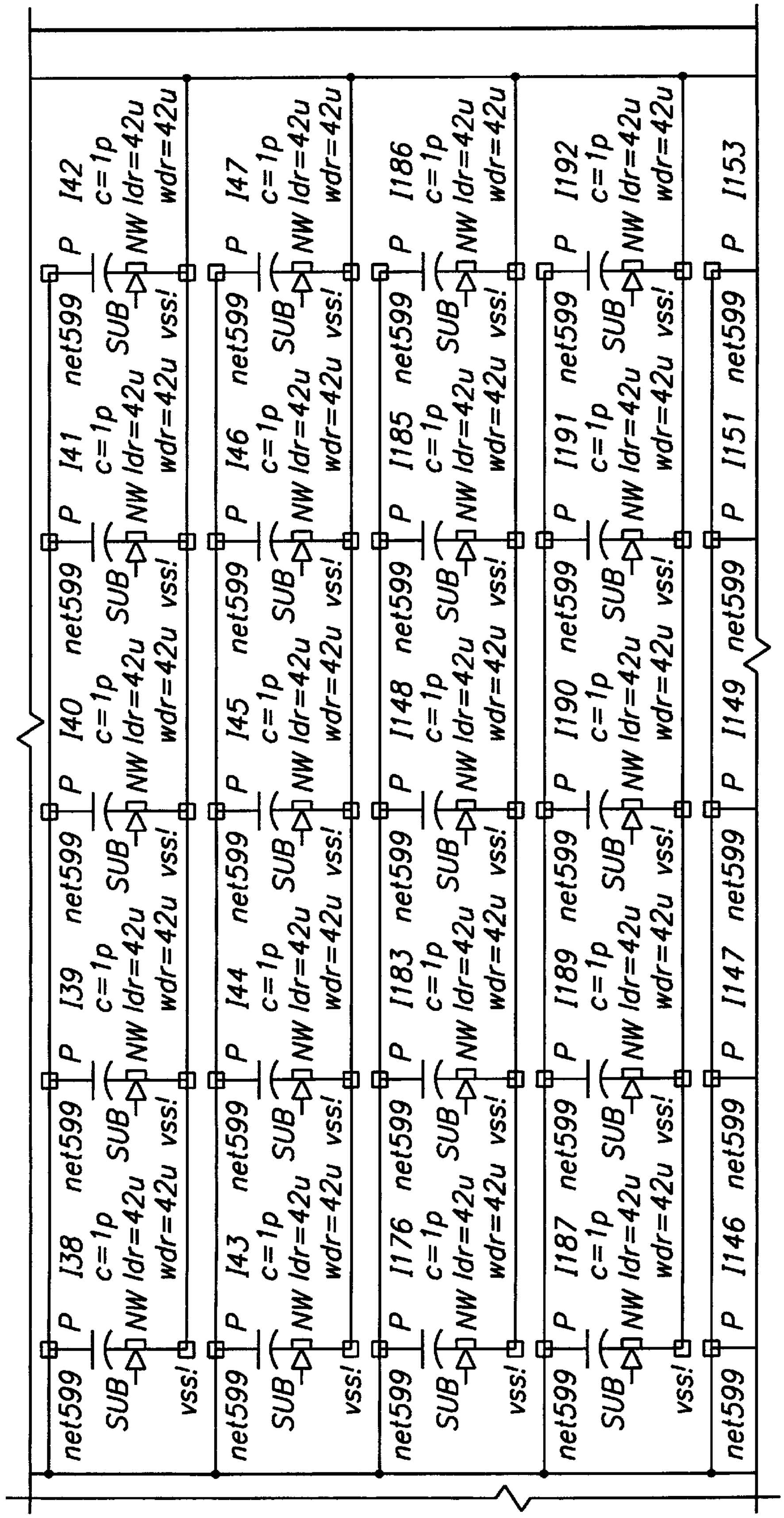
net599
SUB
vss!
P
c=1p
NW ldr=42u
wdr=42u
I38
I39
I40
I41
I42
I43
I44
I45
I46
I47
I176
I183
I148
I185
I186
I187
I189
I190
I191
I192
I146
I147
I149
I151
I153

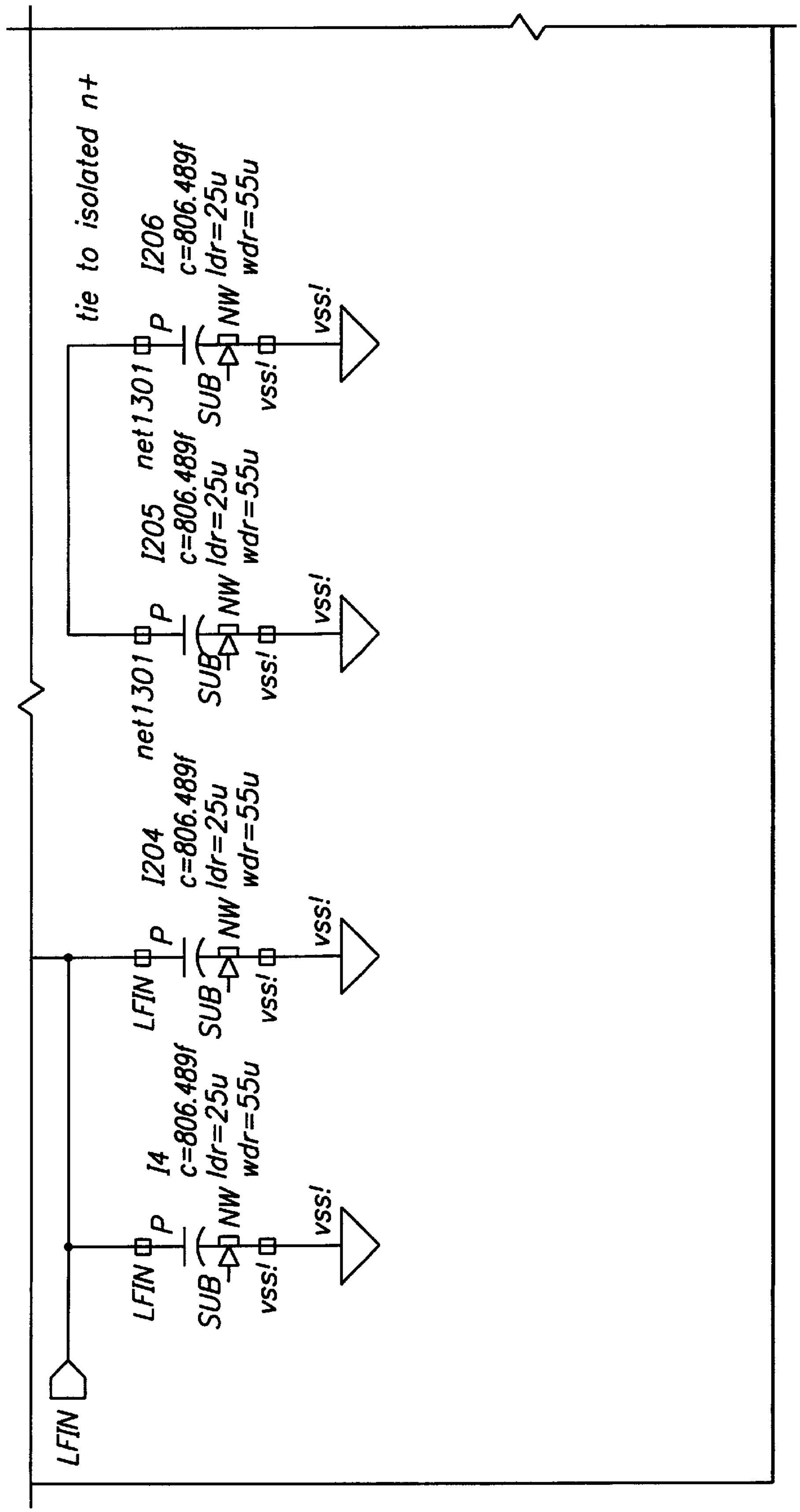
FIG. 8.060I0ECA

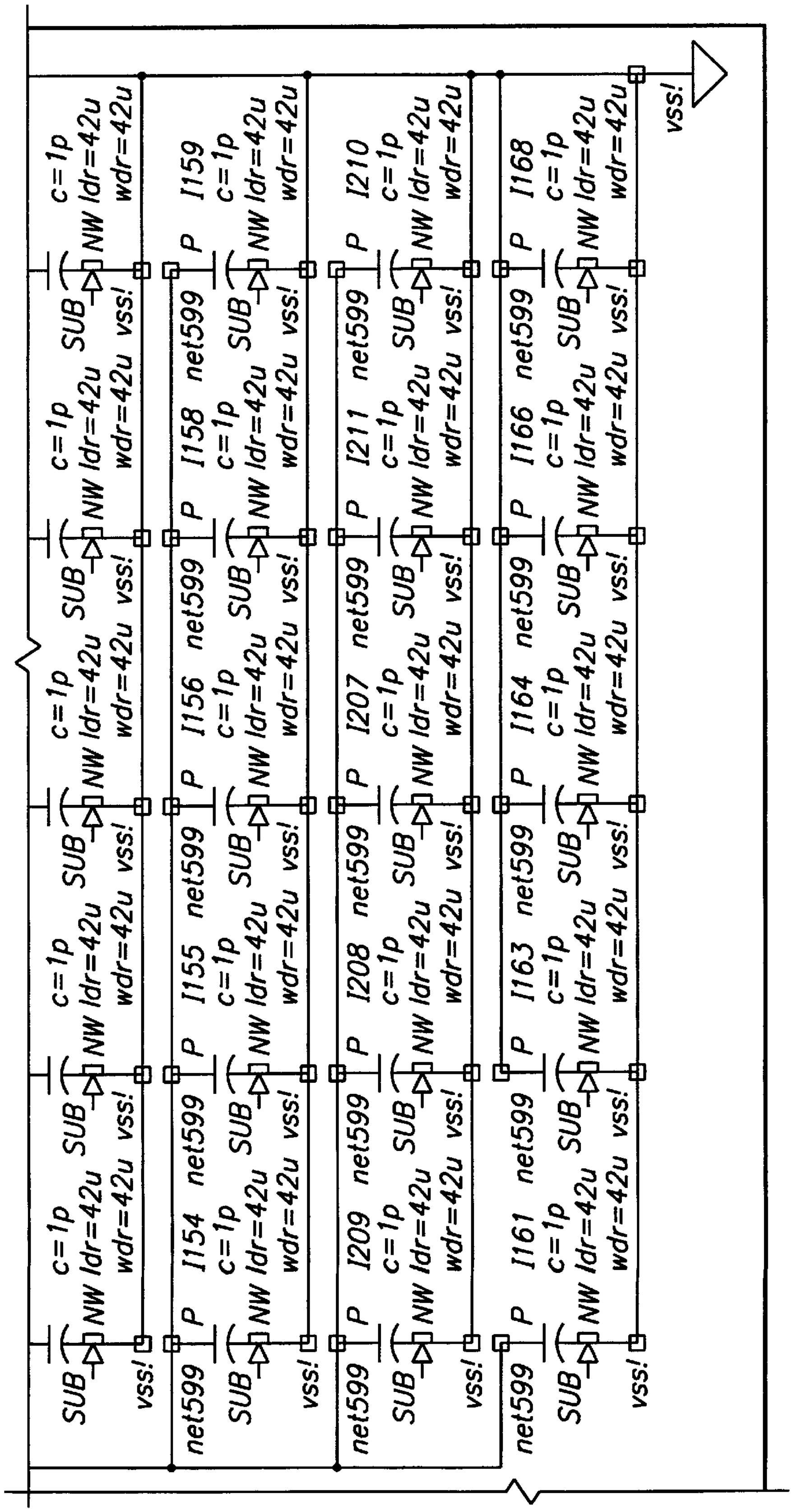
FIG. 8.060103CB

| | | |
|---|---|---|
| 8.060104AA | 8.060104AB | 8.060104AC |
| 8.060104BA | 8.060104BB | 8.060104BC |
| 8.060104CA | 8.060104CB | 8.060104CC |
| 8.060104DA | 8.060104DB | 8.060104DC |

Fig. 8.060104

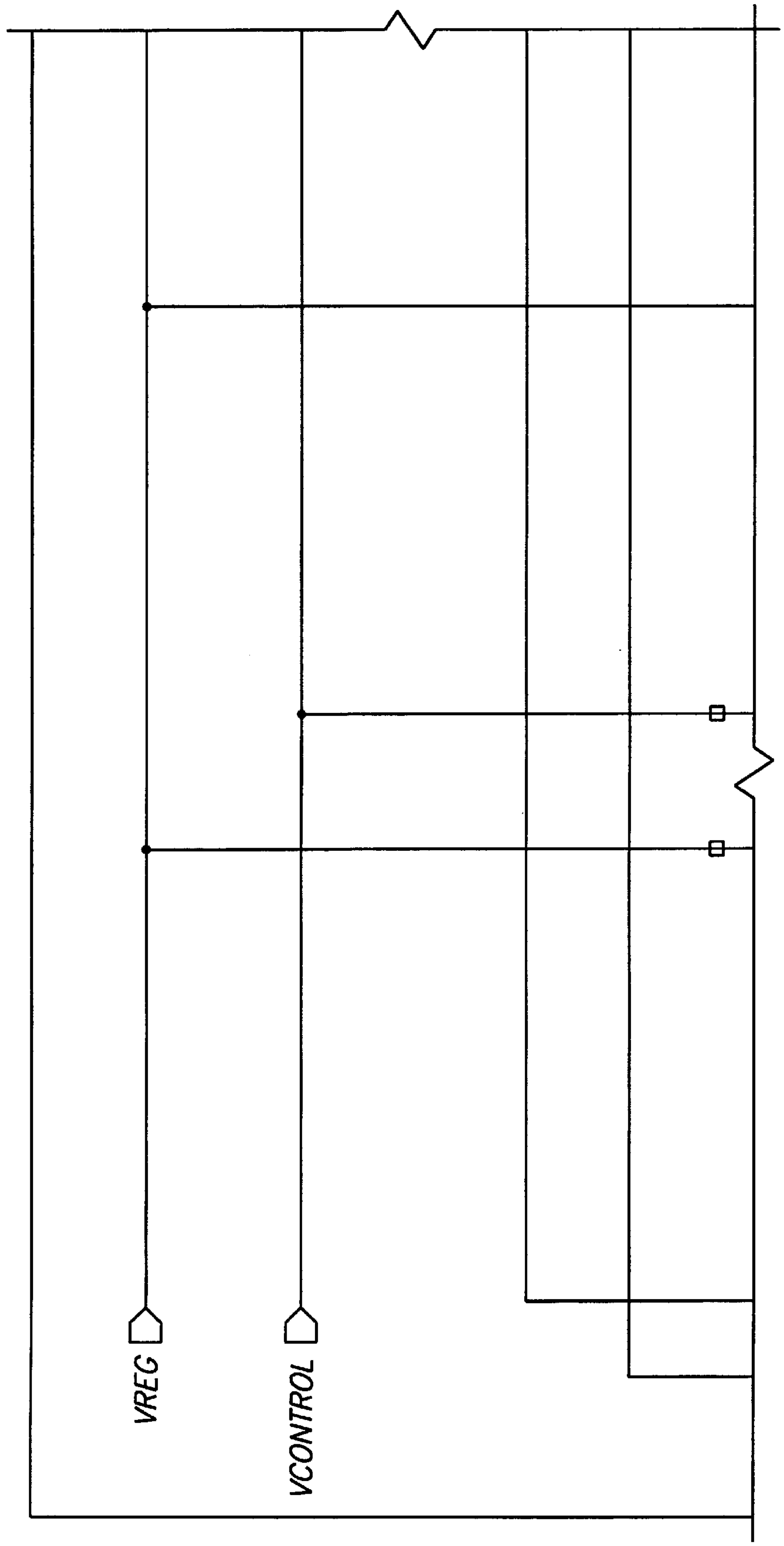
FIG. 8.0650104AA

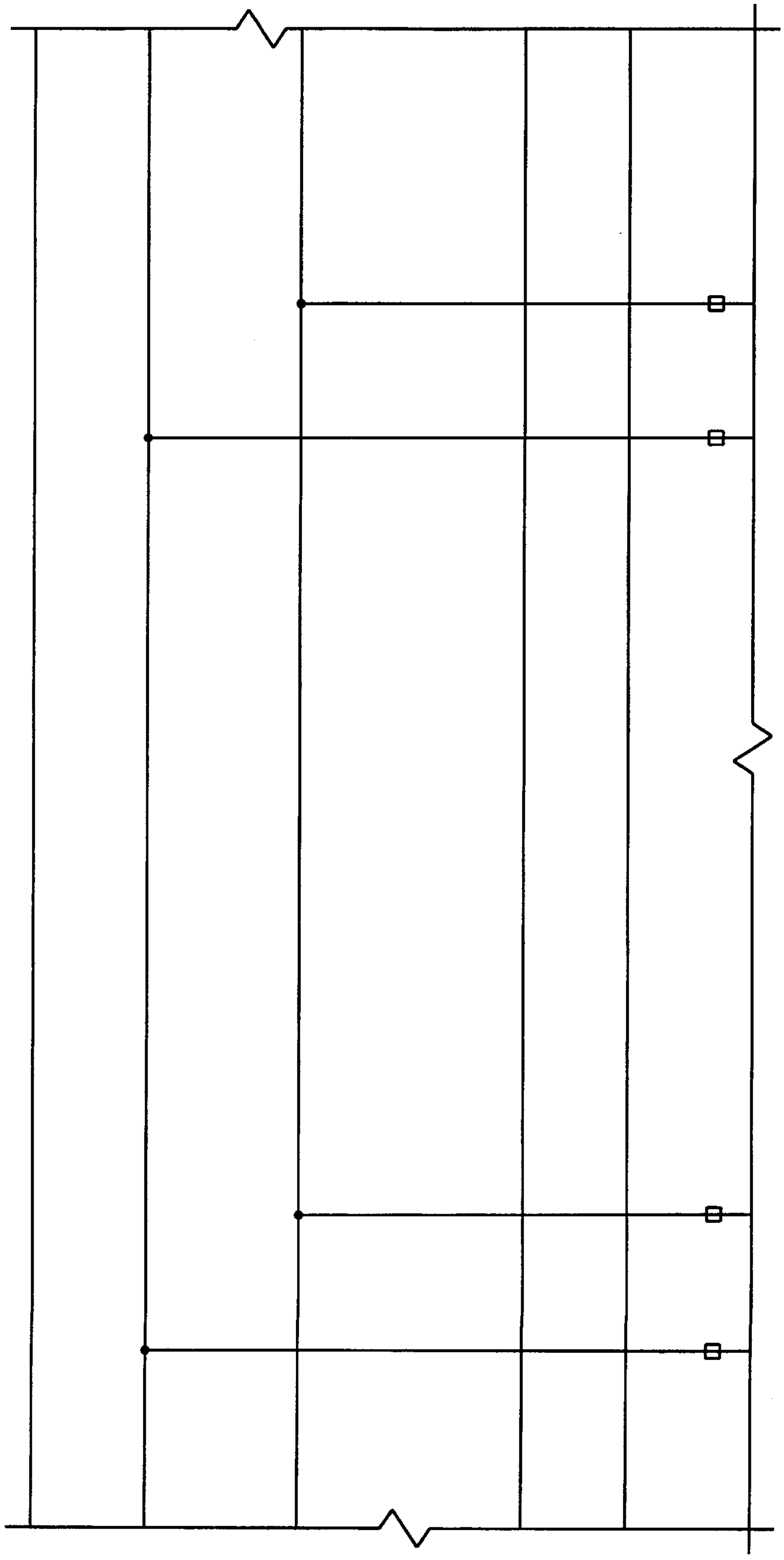
FIG. 8.0690.1074B

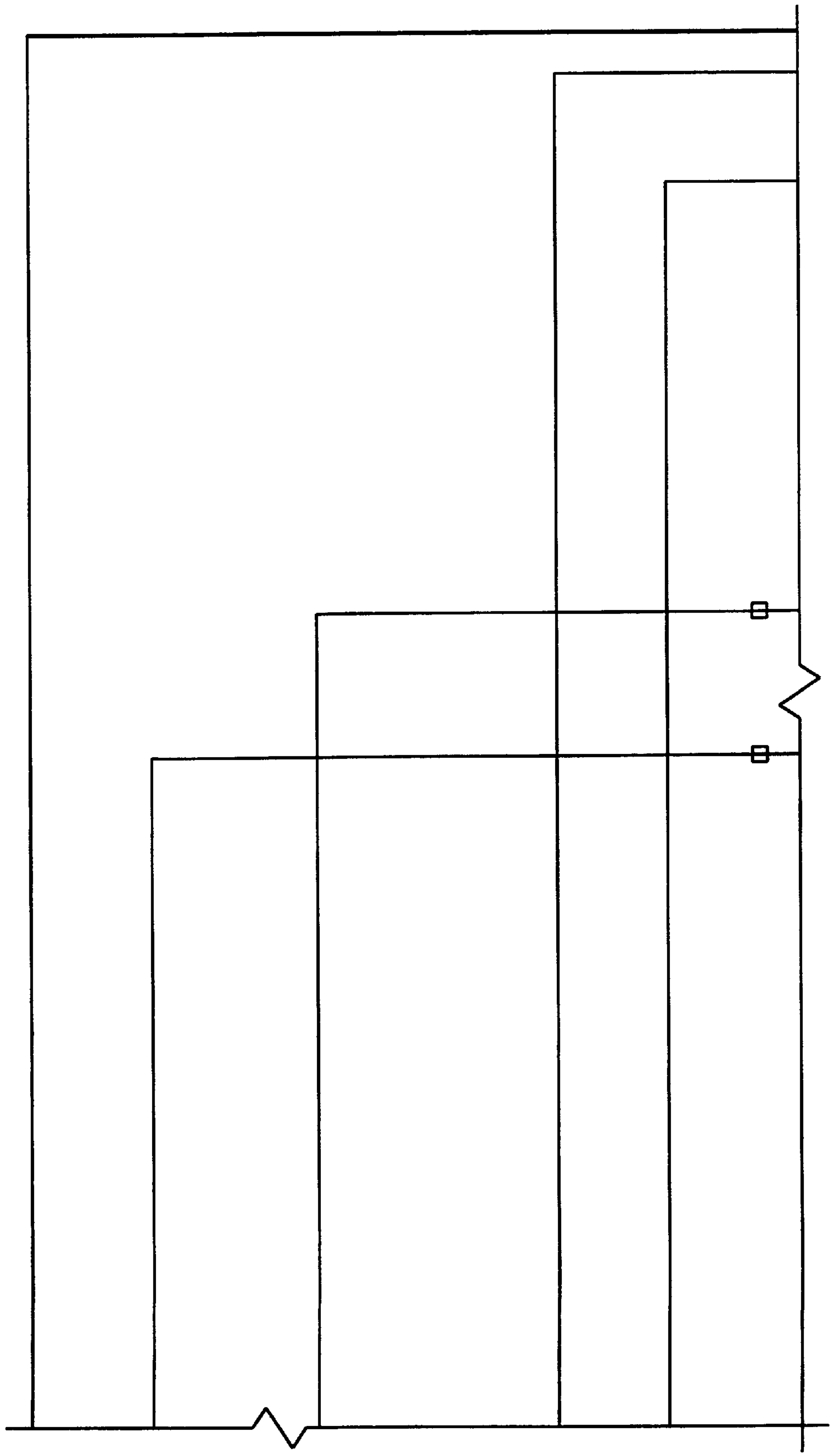
FIG. 8.060104AC

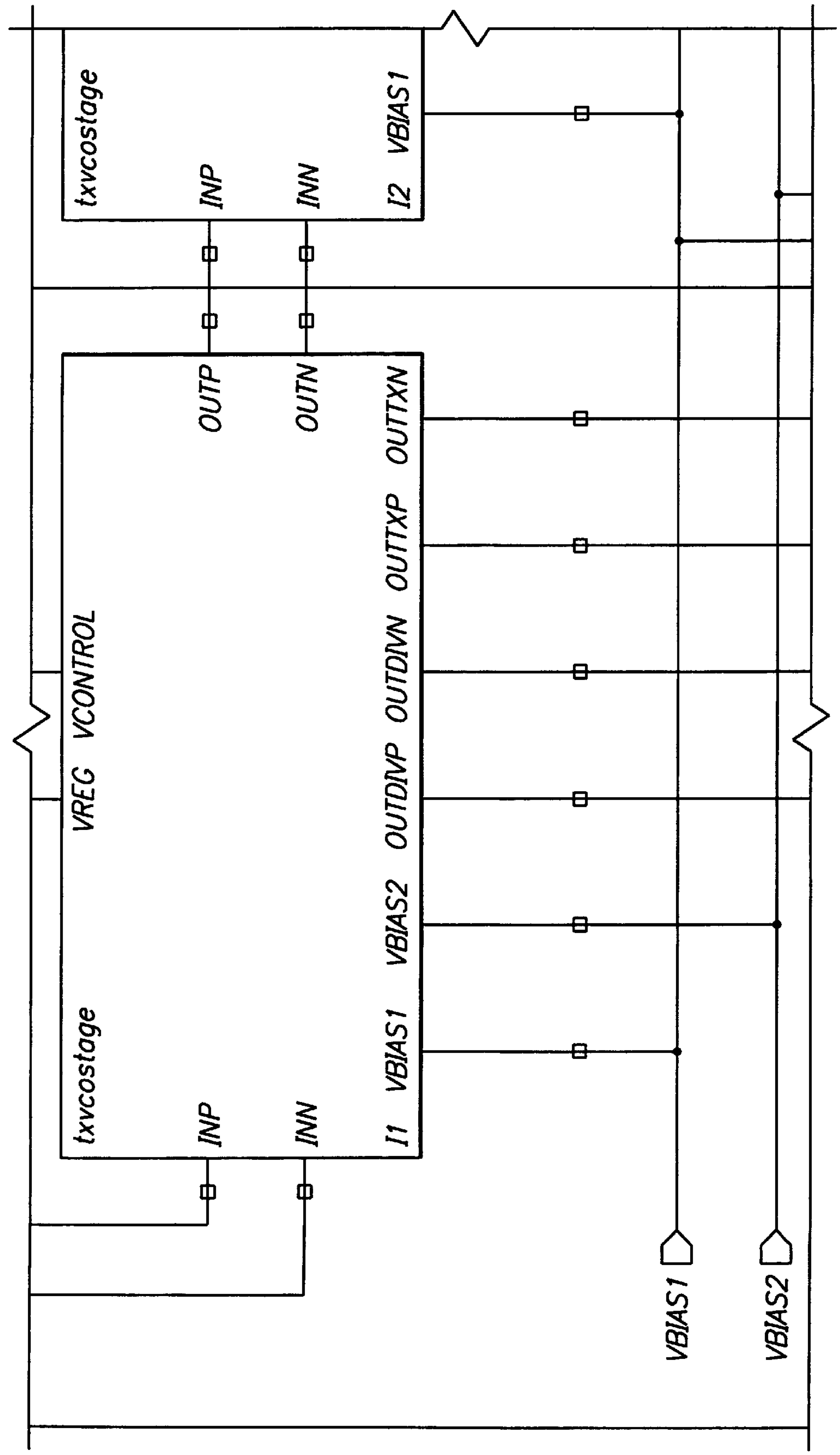
Fig. 8.0601-4BA

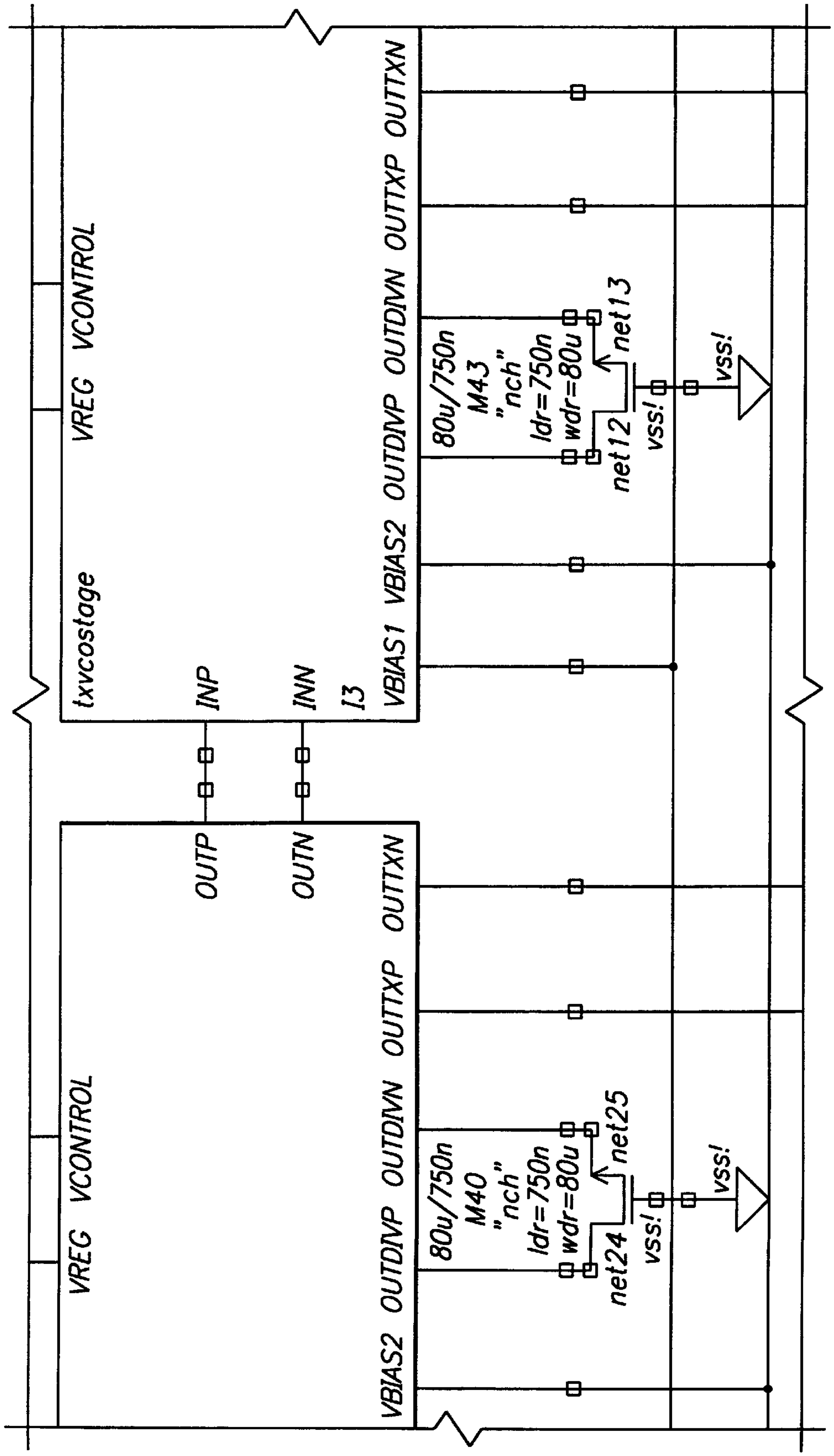
txvcostage
INP
INN
13
VREG
VCONTROL
VBIAS1
VBIAS2
OUTDIVP
OUTDIVN
OUTTXP
OUTTXN
80u/750n
M43
"nch"
ldr=750n
wdr=80u
net12
net13
vss!
vss!
OUTP
OUTN
VREG
VCONTROL
VBIAS2
OUTDIVP
OUTDIVN
OUTTXP
OUTTXN
80u/750n
M40
"nch"
ldr=750n
wdr=80u
net24
net25
vss!
vss!

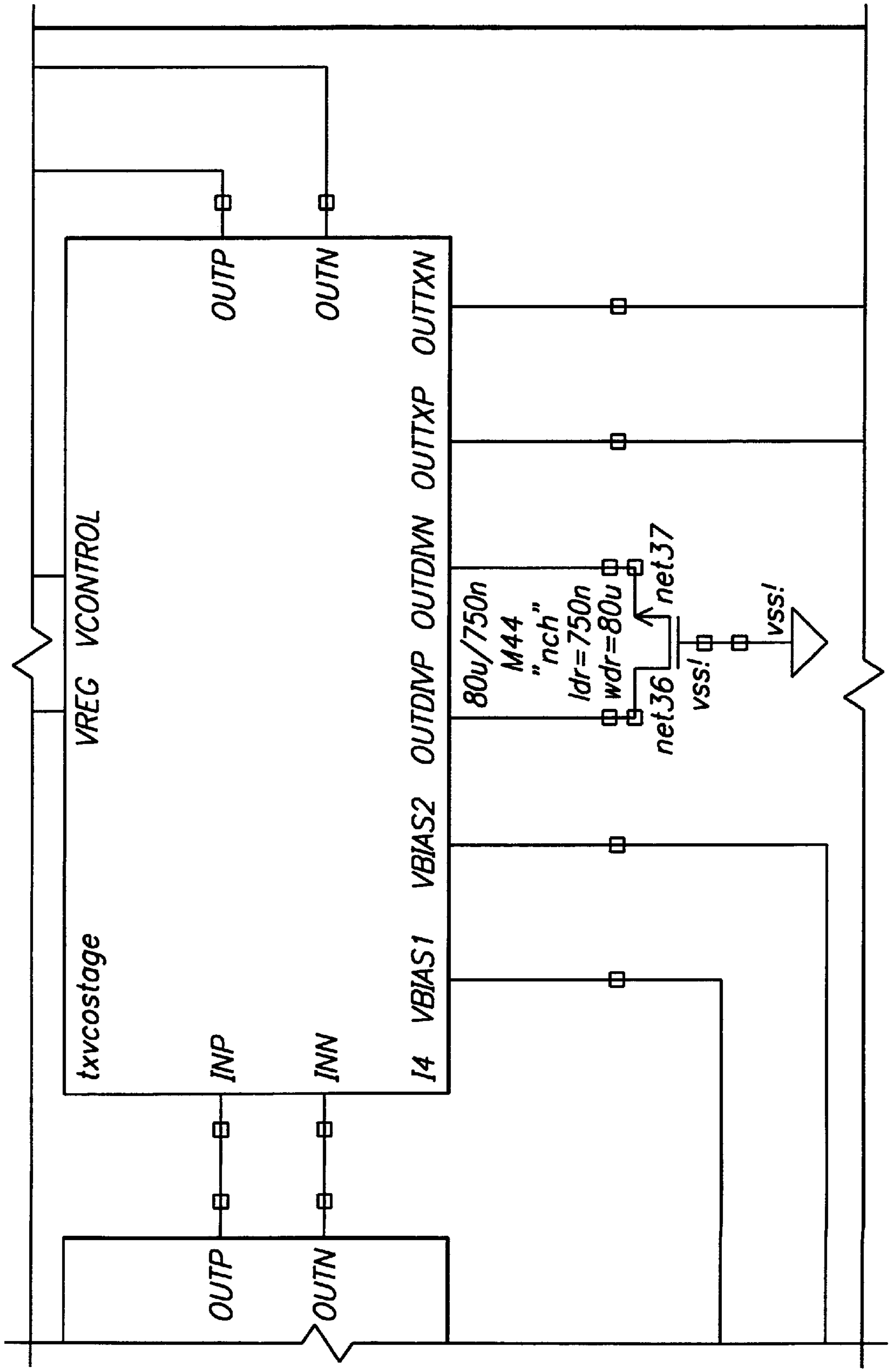
Fig. 8.050104BC

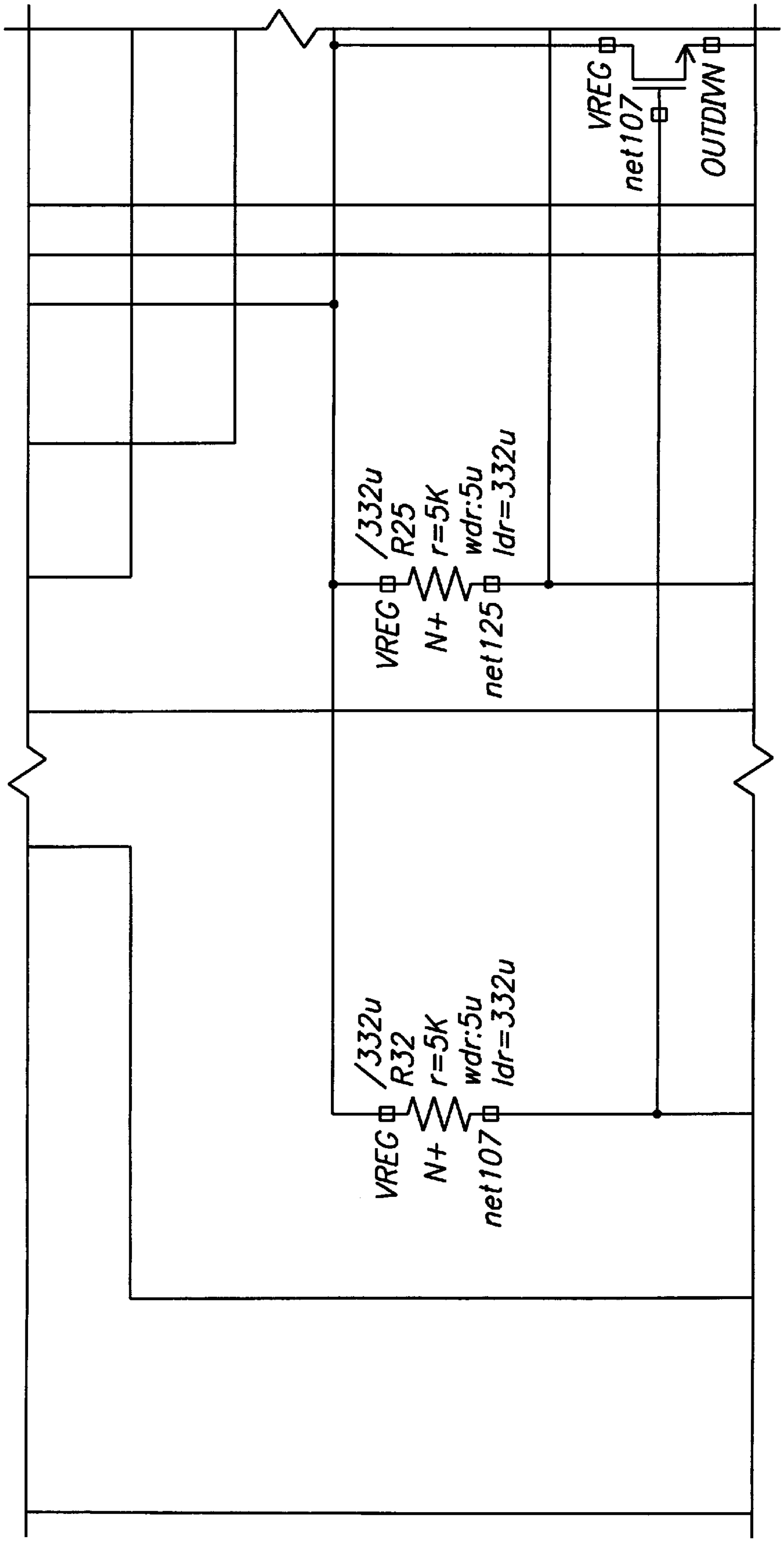
FIG. 8.0060104CA

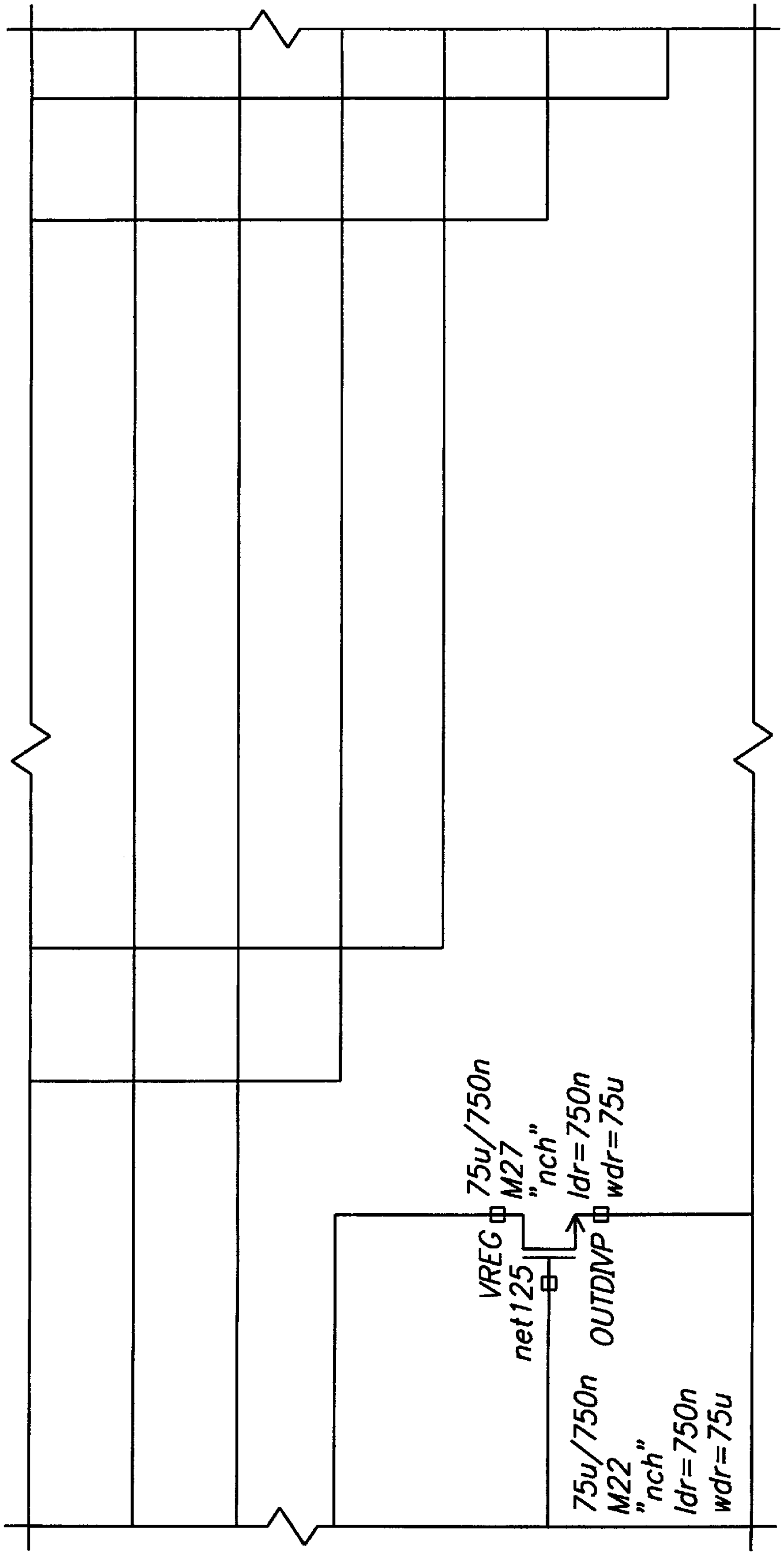
FIG. 8.06010.4CB

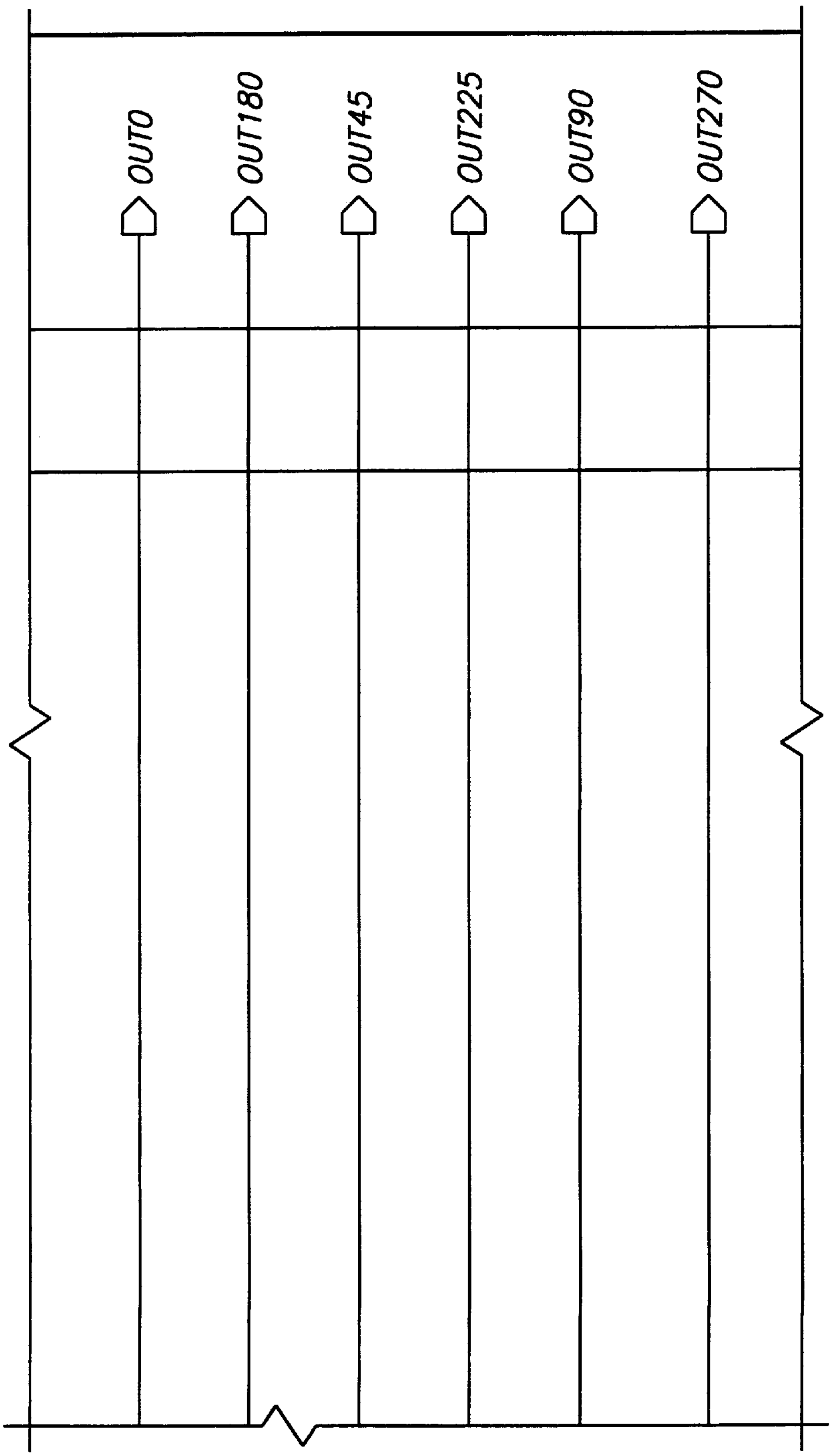
FIG. 8.060104CC

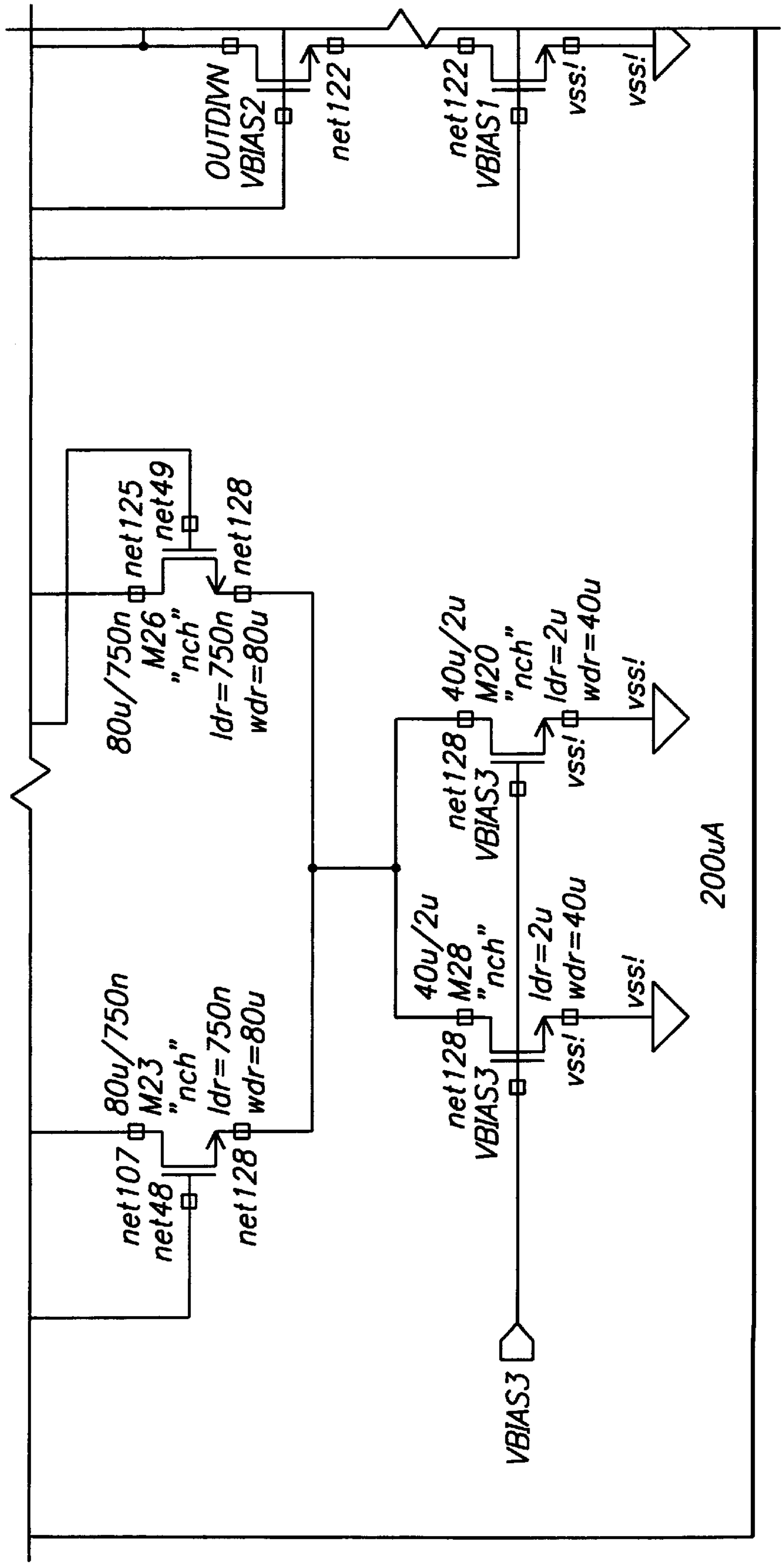
OUTDIVN
VBIAS2
net122
net122
VBIAS1
vss!
vss!
net125
net49
net128
80u/750n
M26
"nch"
ldr=750n
wdr=80u
40u/2u
M20
"nch"
ldr=2u
wdr=40u
vss!
net128
VBIAS3
vss!
200uA
40u/2u
M28
"nch"
ldr=2u
wdr=40u
vss!
net128
VBIAS3
vss!
80u/750n
M23
"nch"
ldr=750n
wdr=80u
net107
net48
net128
VBIAS3

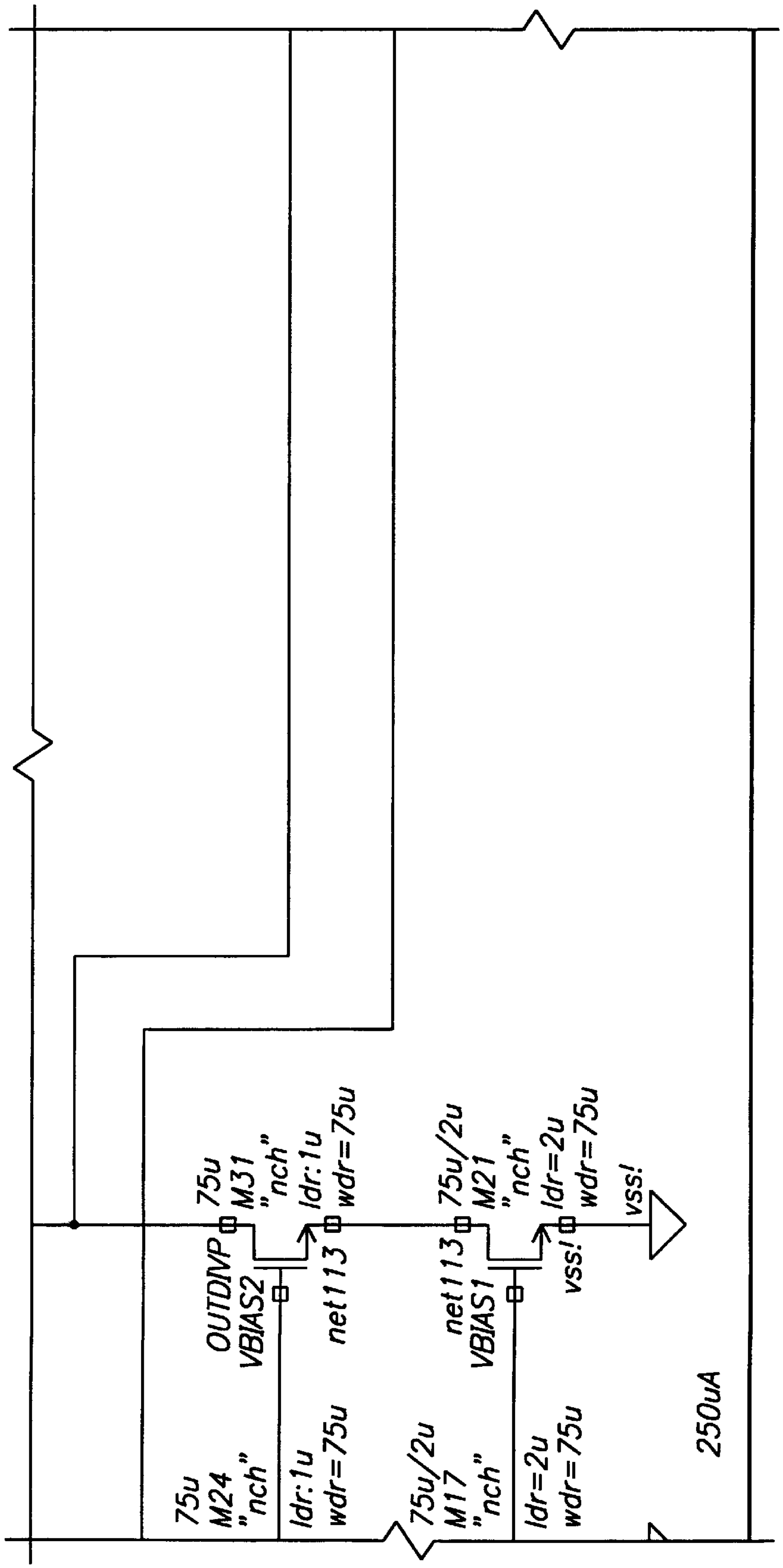
Fig. 8.0601.04DB

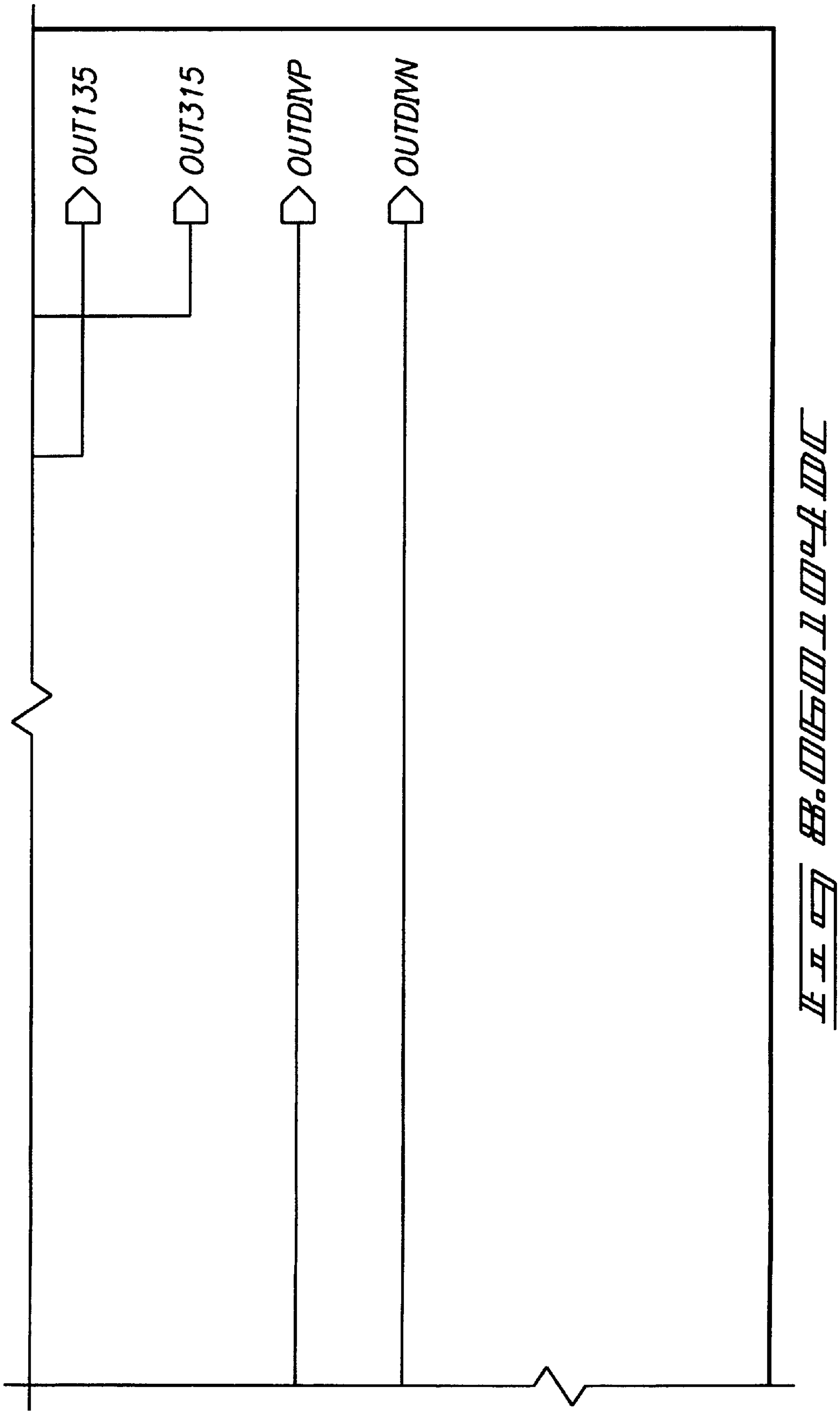
FIG. 8.061040C

| | | | |
|---|---|---|---|
| 8.06010401AA | 8.06010401AB | 8.06010401AC | 8.06010401AD |
| 8.06010401BA | 8.06010401BB | 8.06010401BC | 8.06010401BD |

Fig 8.06010401

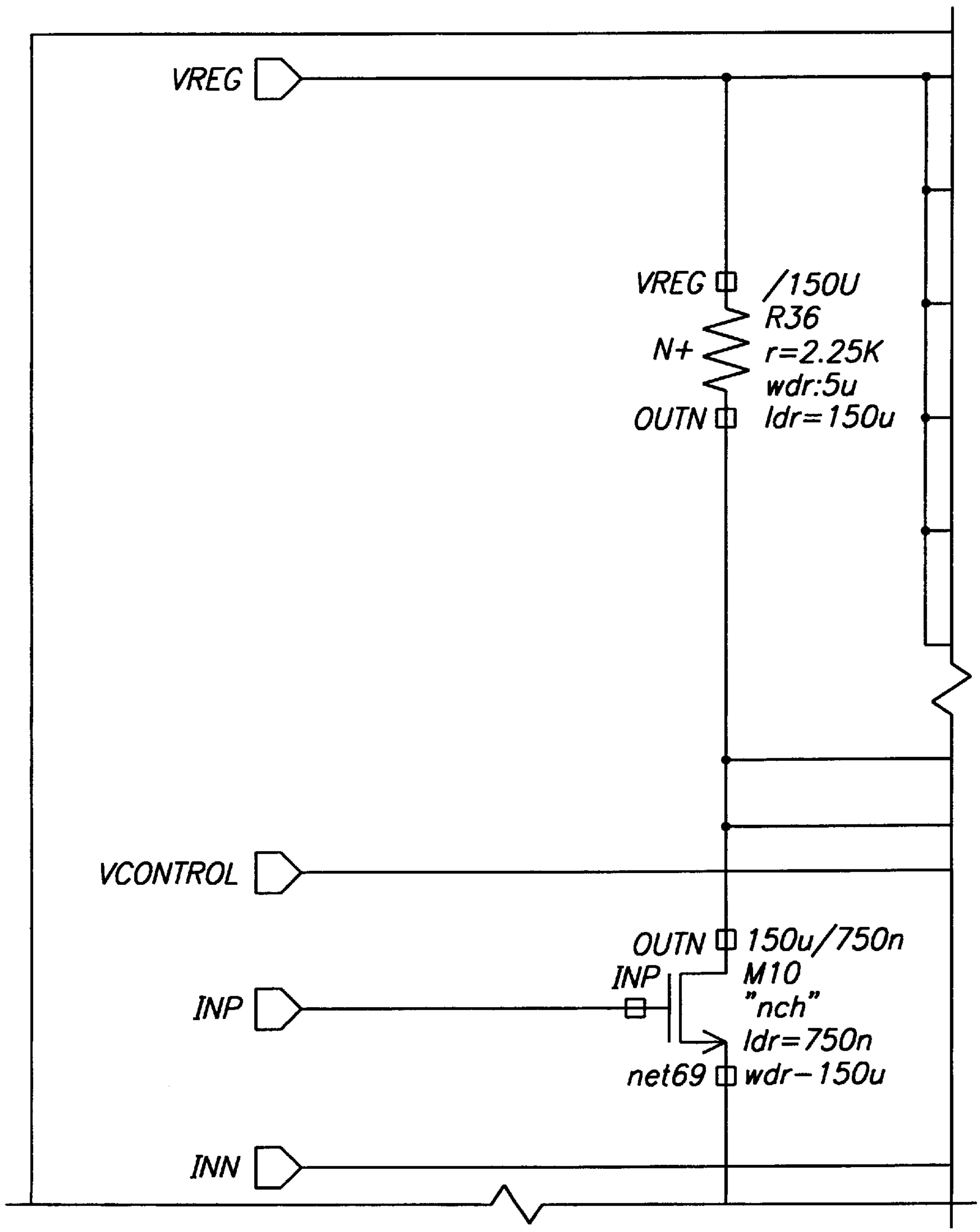
Fig 8.0601040.1AA

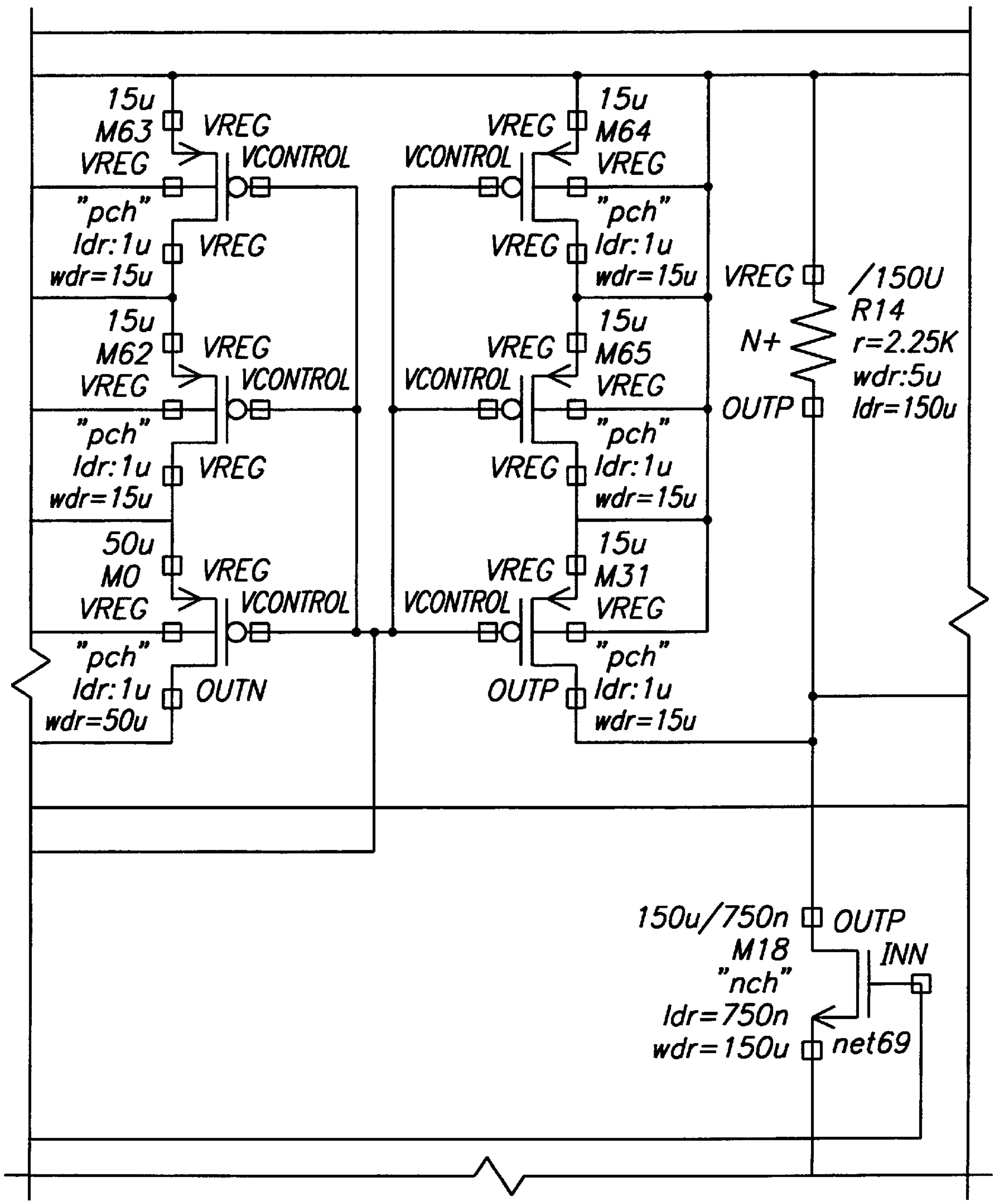
FIG. 8.06010401AB

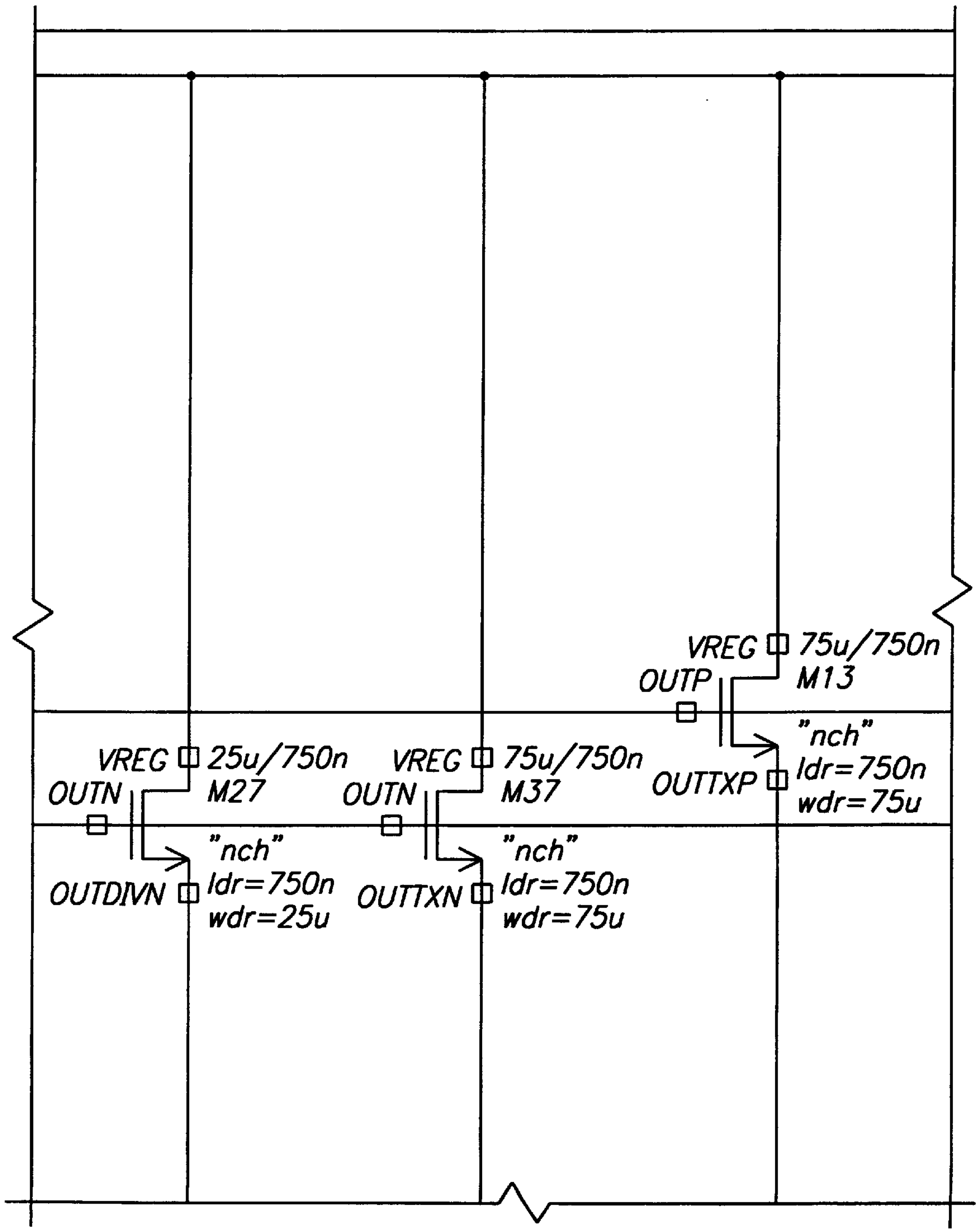
Fig 8.06010401AC

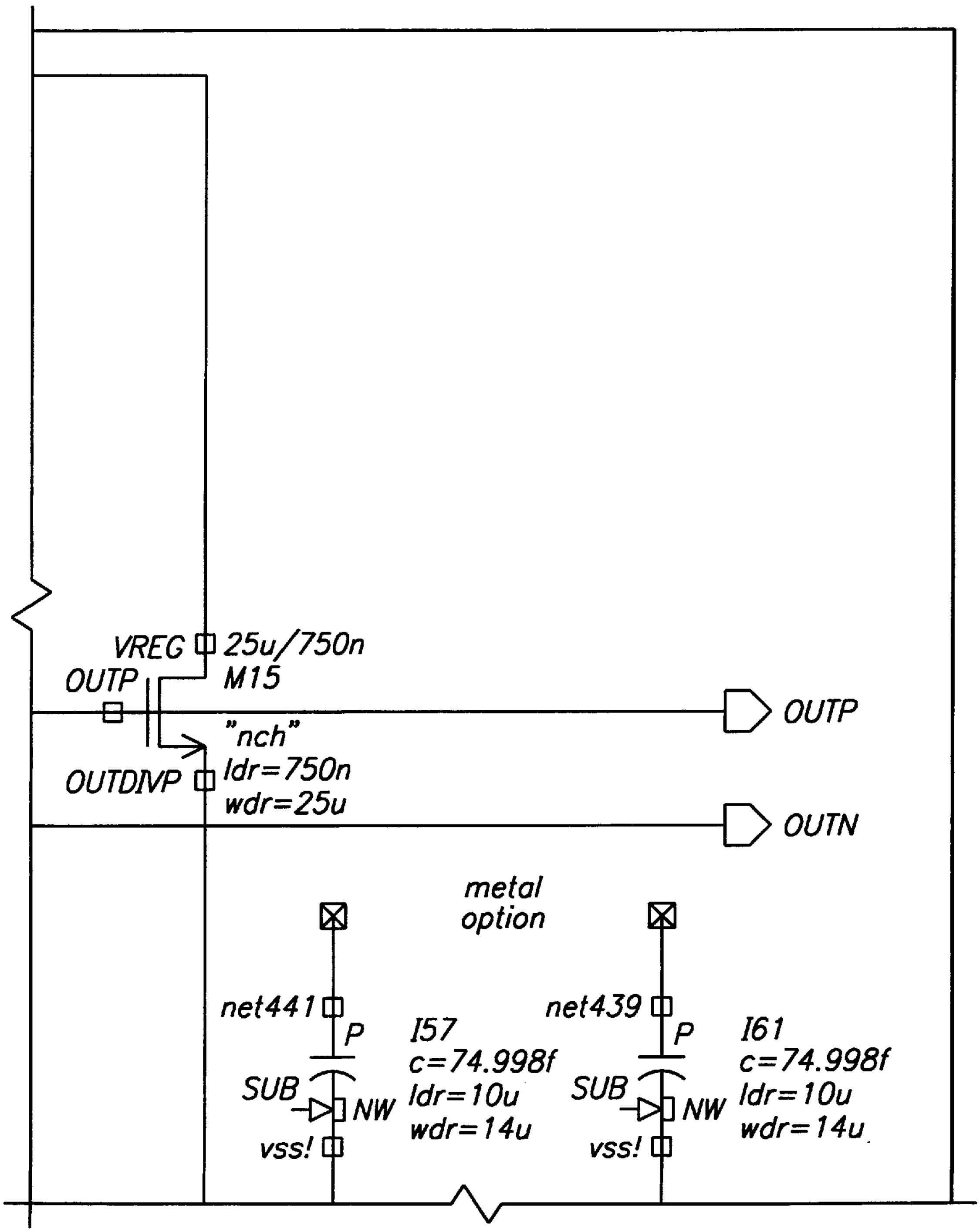
Fig 8.06010401AD

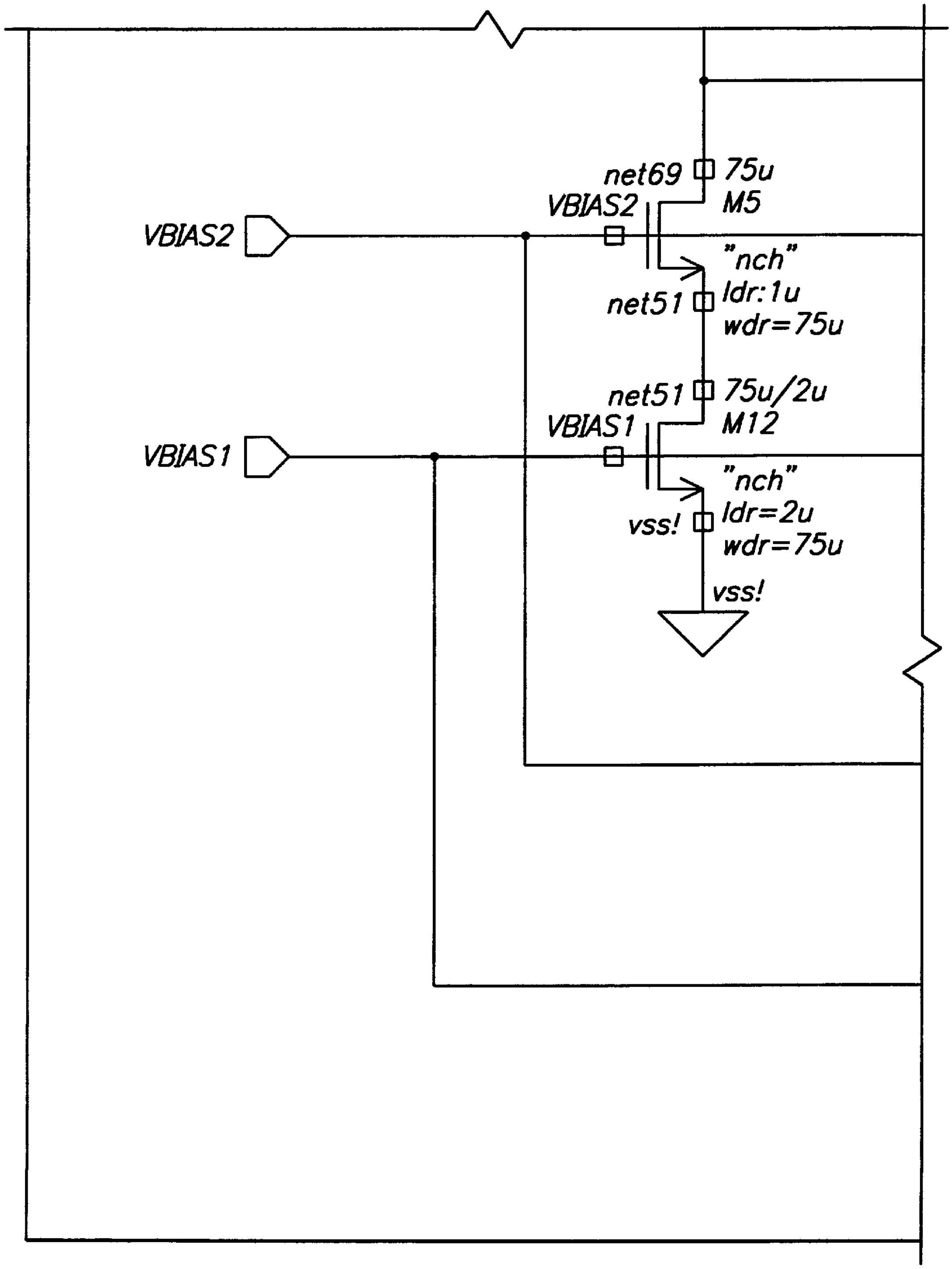
Fig 8.0601040.1BA

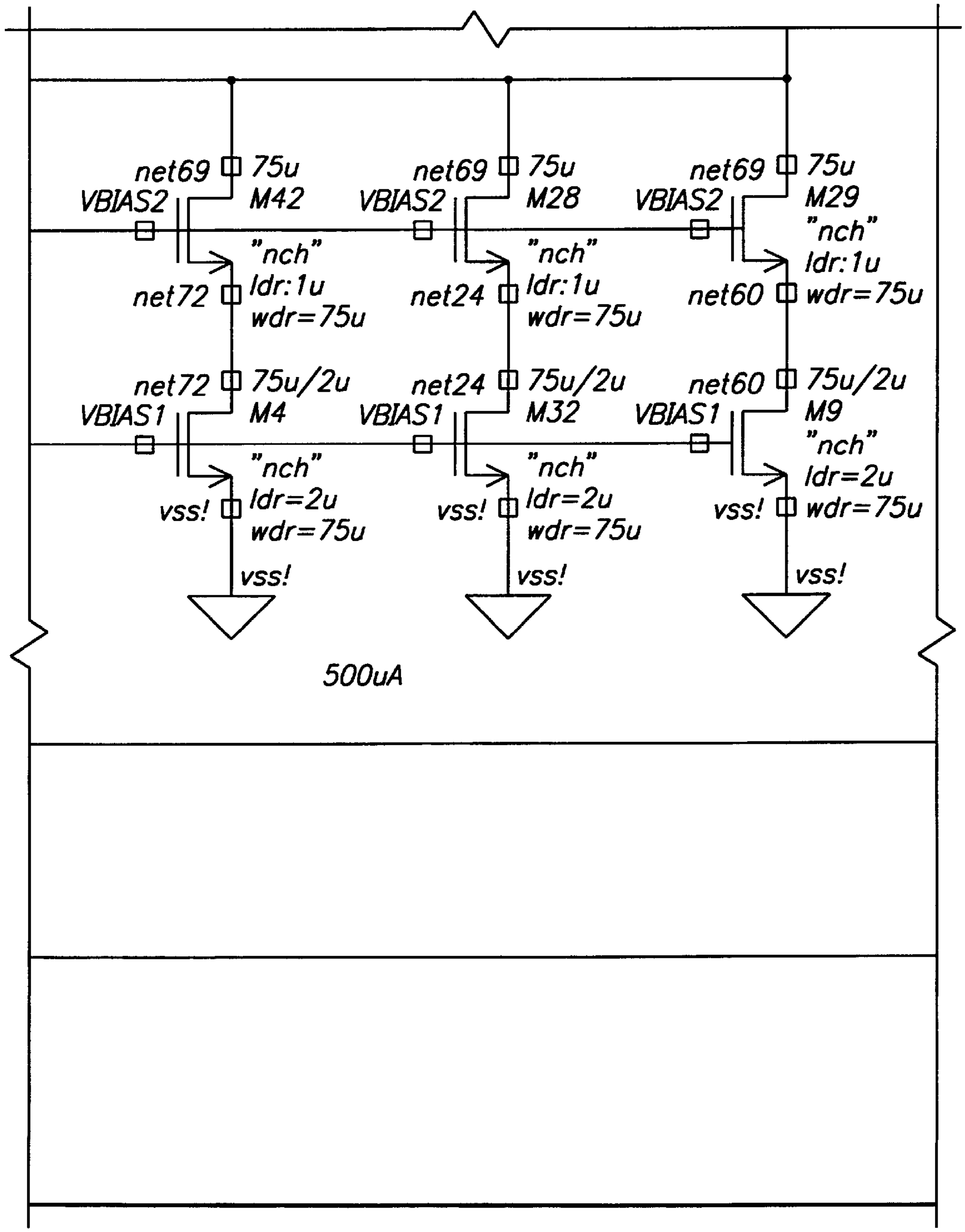
Fig 8.06010401BB

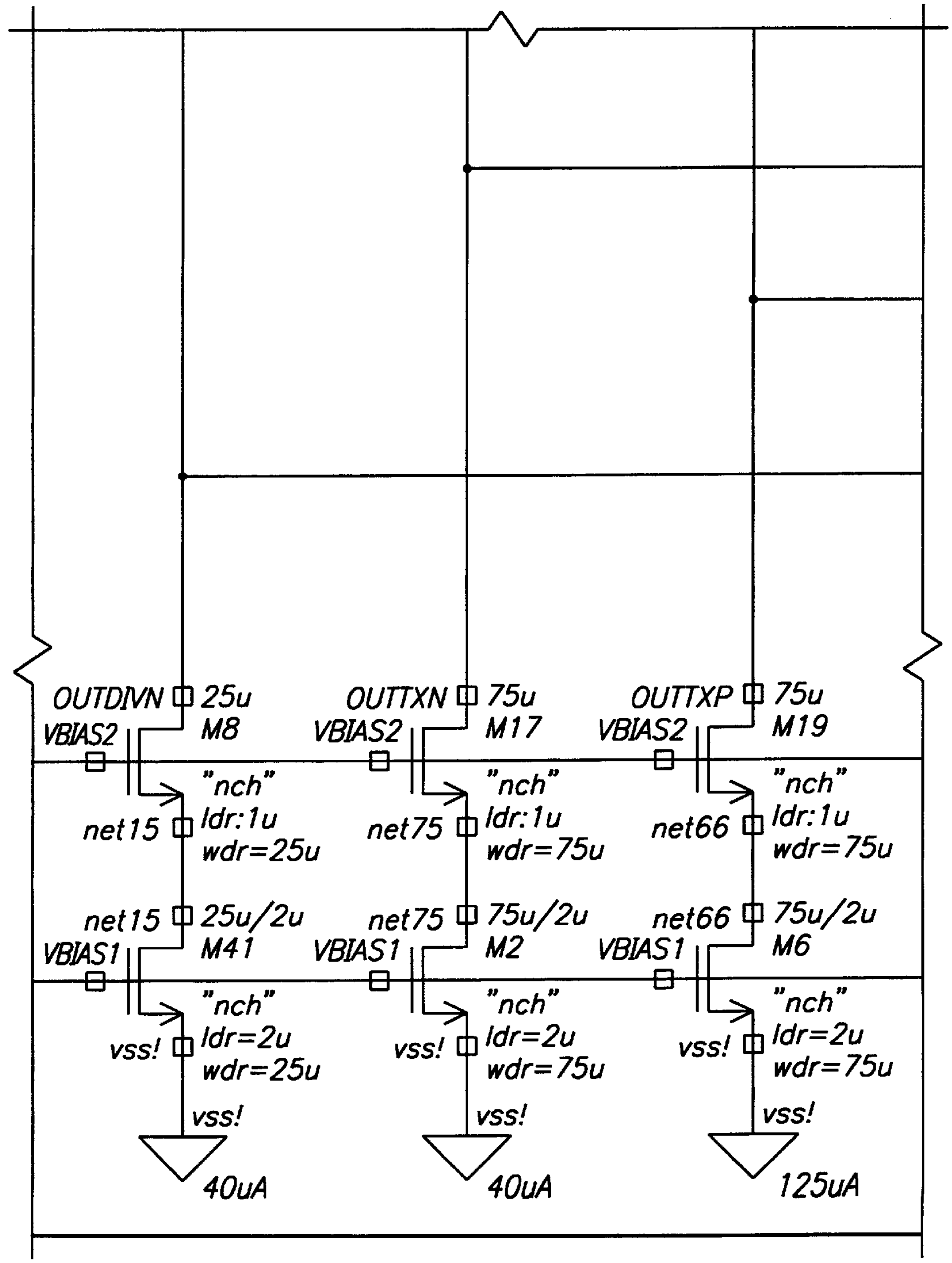
Fig 8.06010401BC

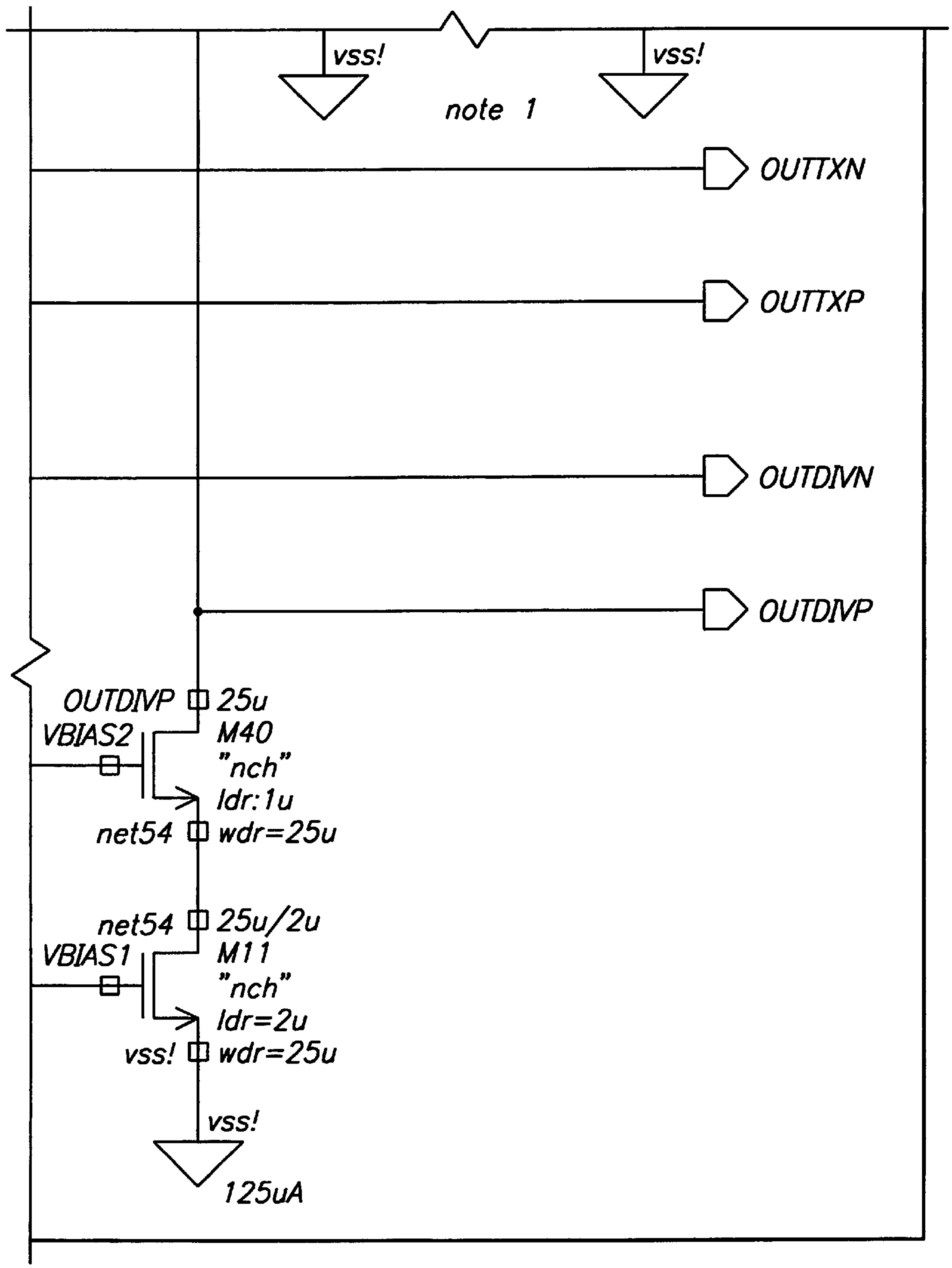
Fig 8.06010401BD

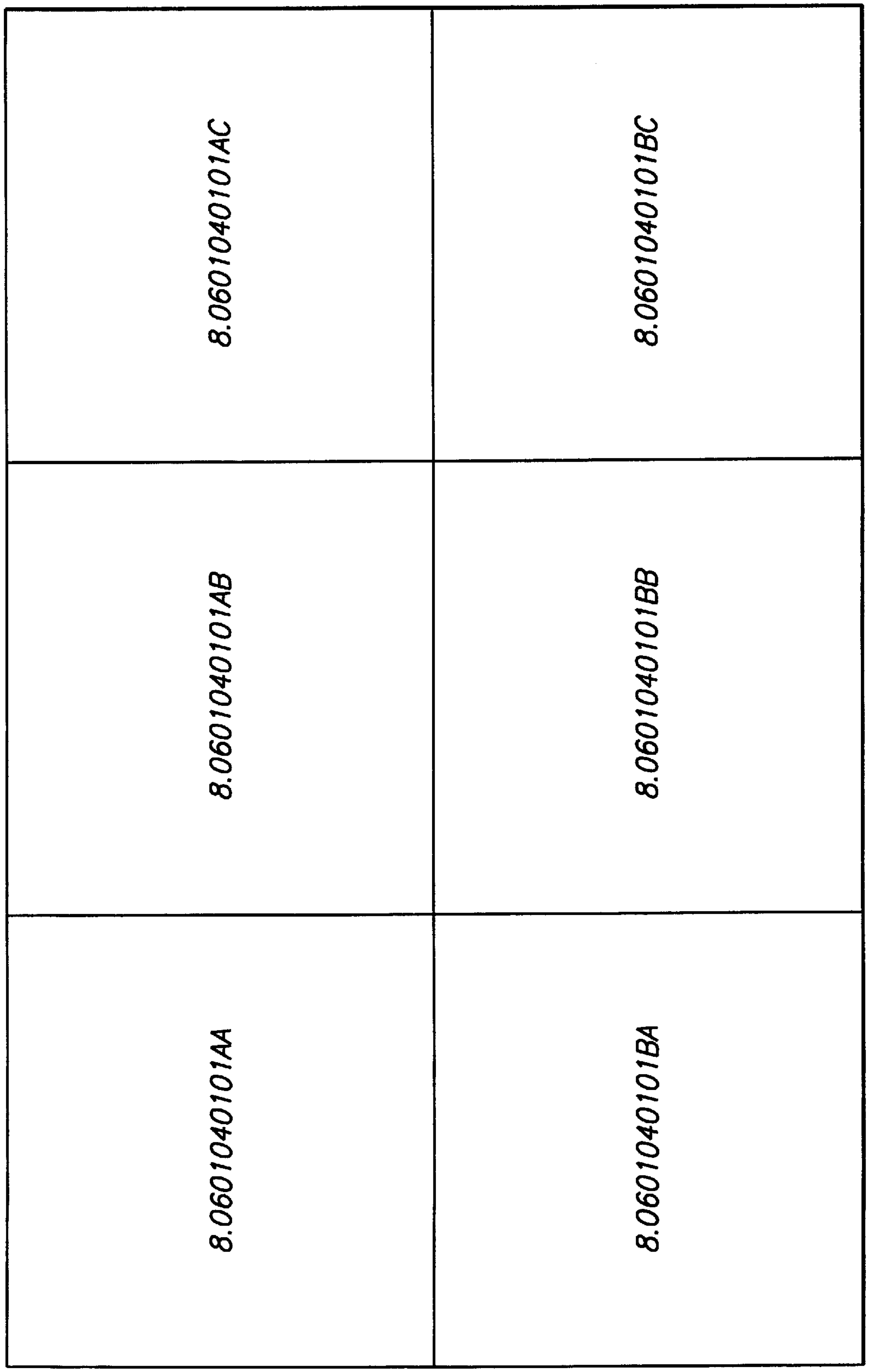
Fig. 8.0601040101

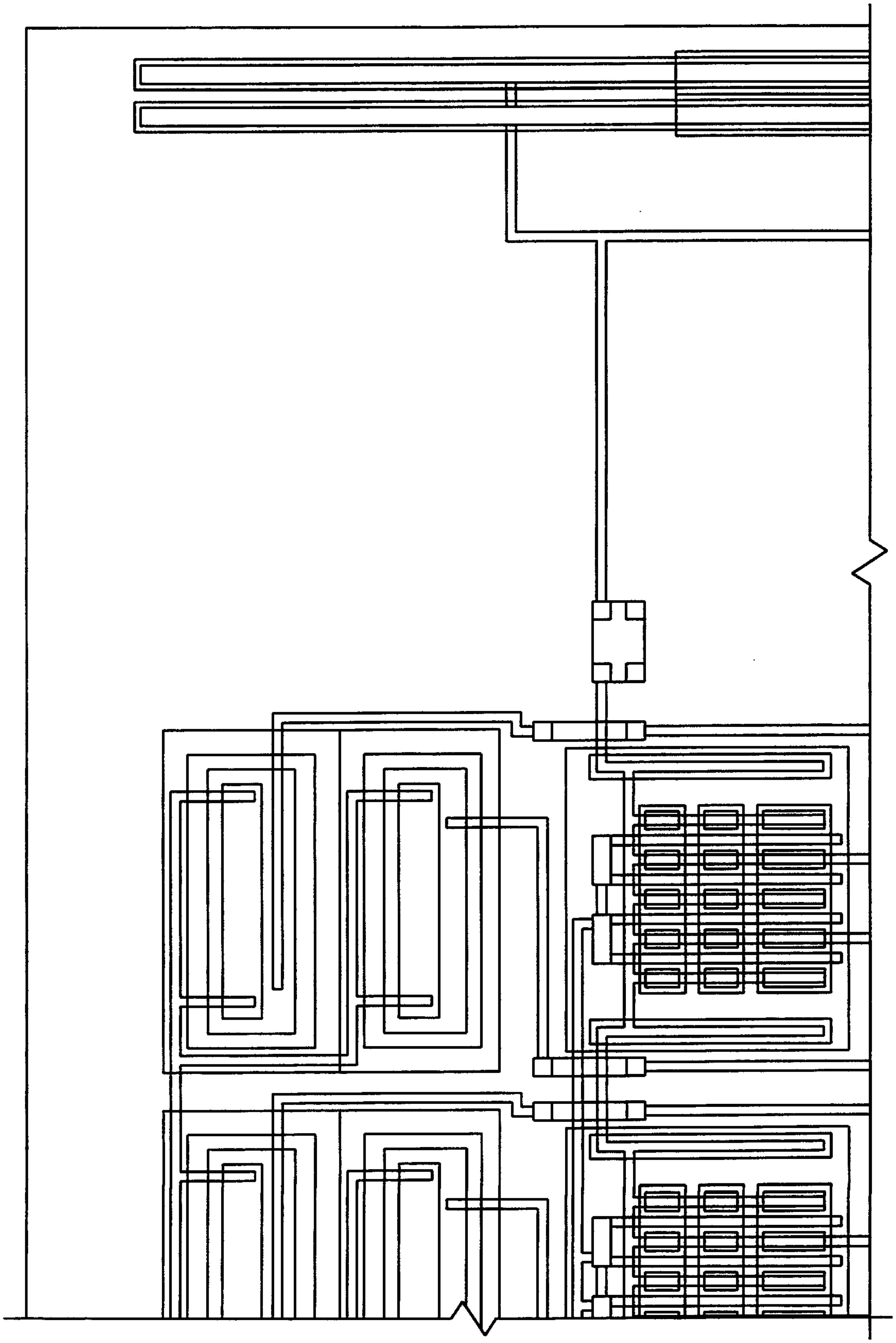
Fig 8.0601040101AA

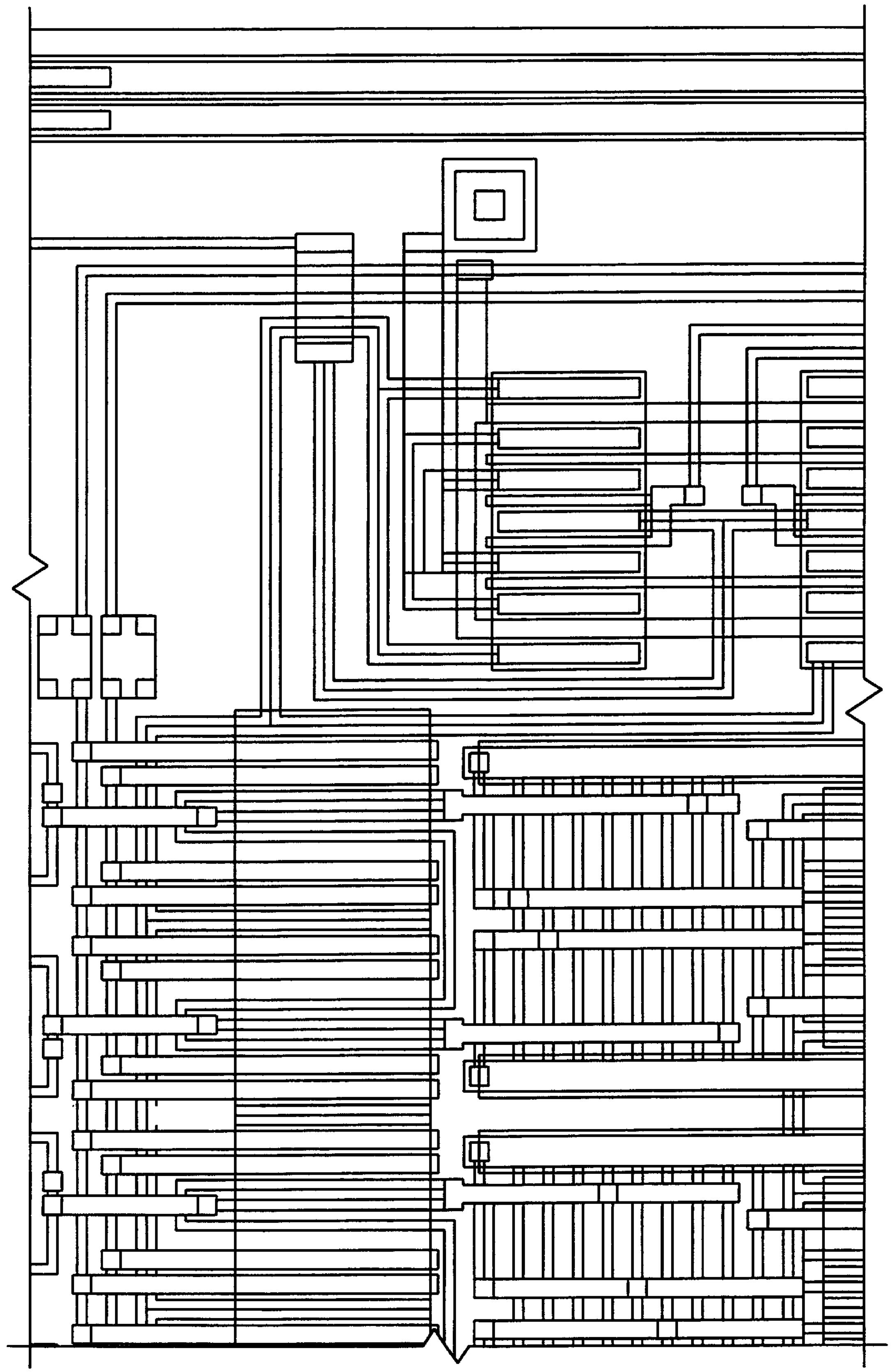
Fig 8.06010401010AB

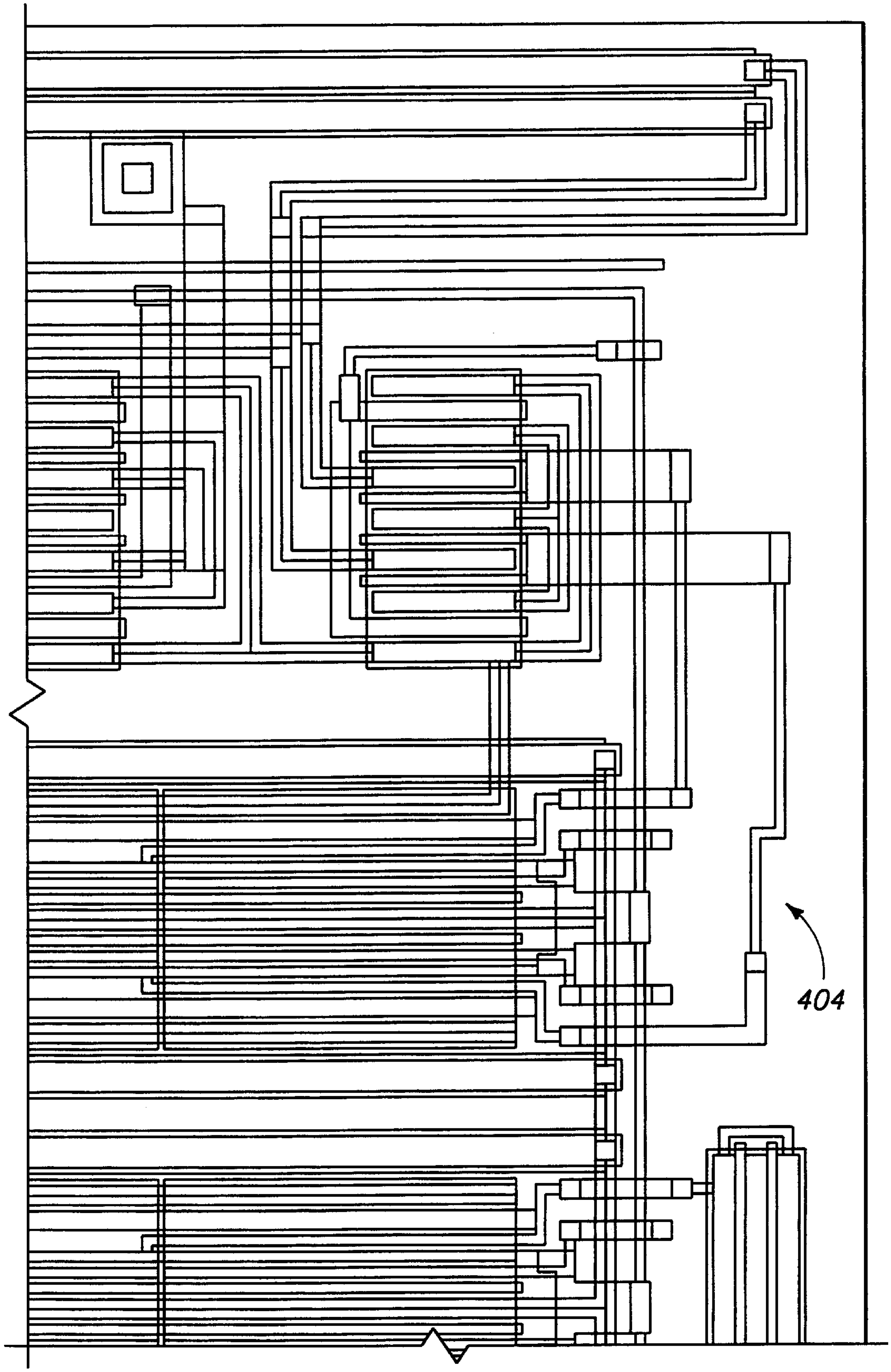
FIG 8.060104010IAC

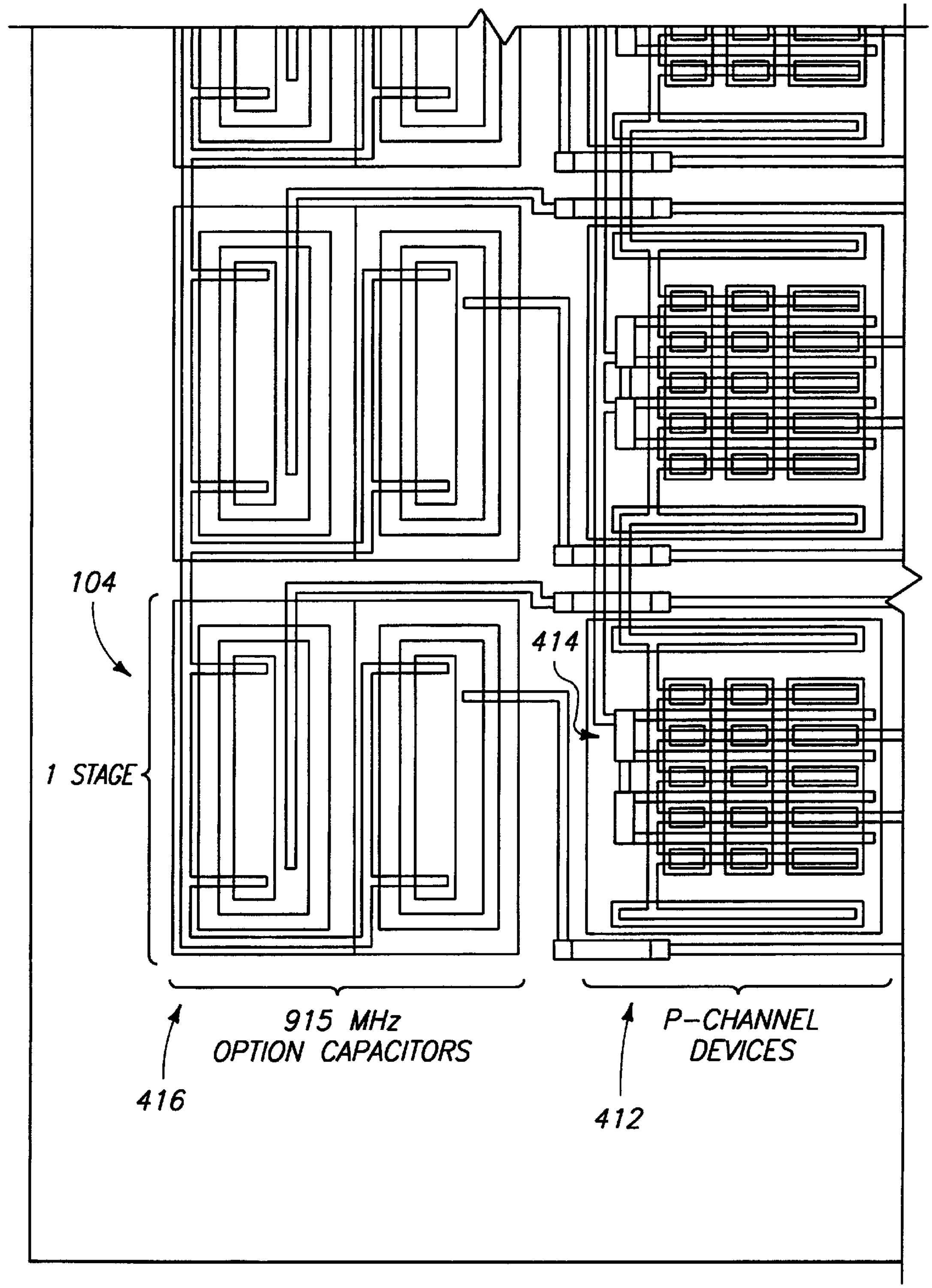
Fig. 8.0601040101BA

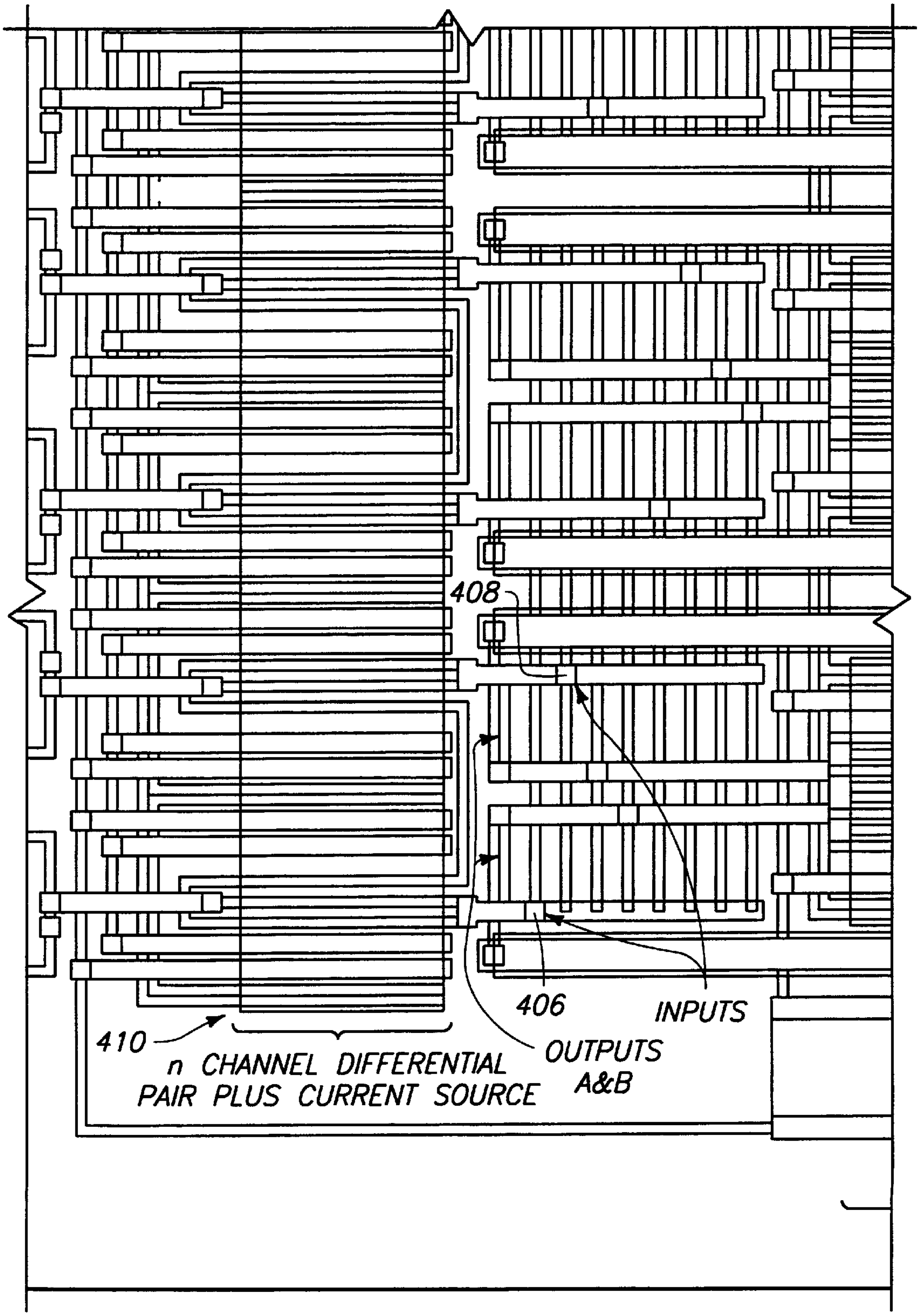
Fig 8.06010401 01BB

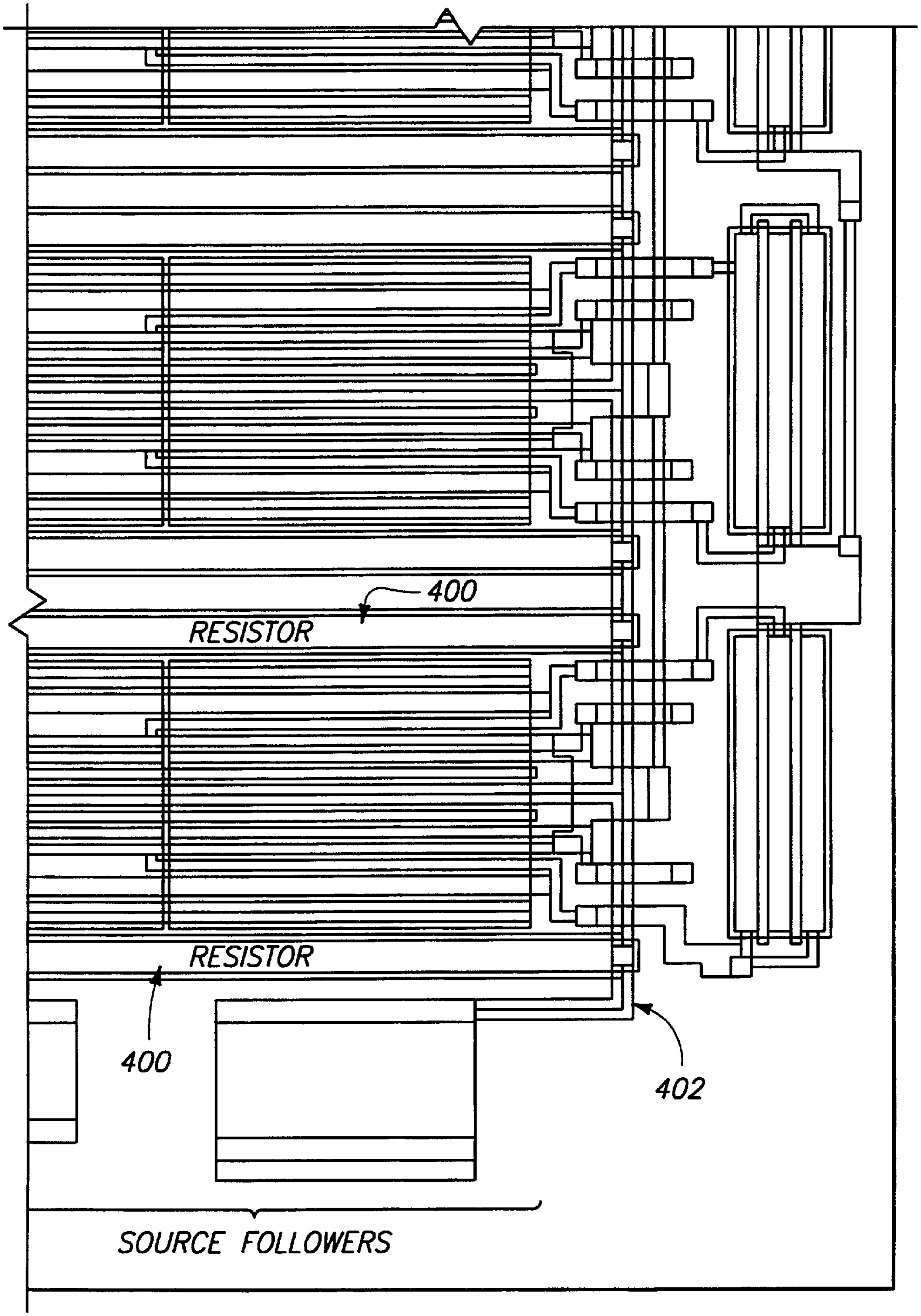
Fig 8.0601040101BC

| | | | |
|---|---|---|---|
| 8.060105AA | 8.060105AB | 8.060105AC | 8.060105AD |
| 8.060105BA | 8.060105BB | 8.060105BC | 8.060105BD |
| 8.060105CA | 8.060105CB | 8.060105CC | 8.060105CD |
| 8.060105DA | 8.060105DB | 8.060105DC | 8.060105DD |

Fig 8.060105

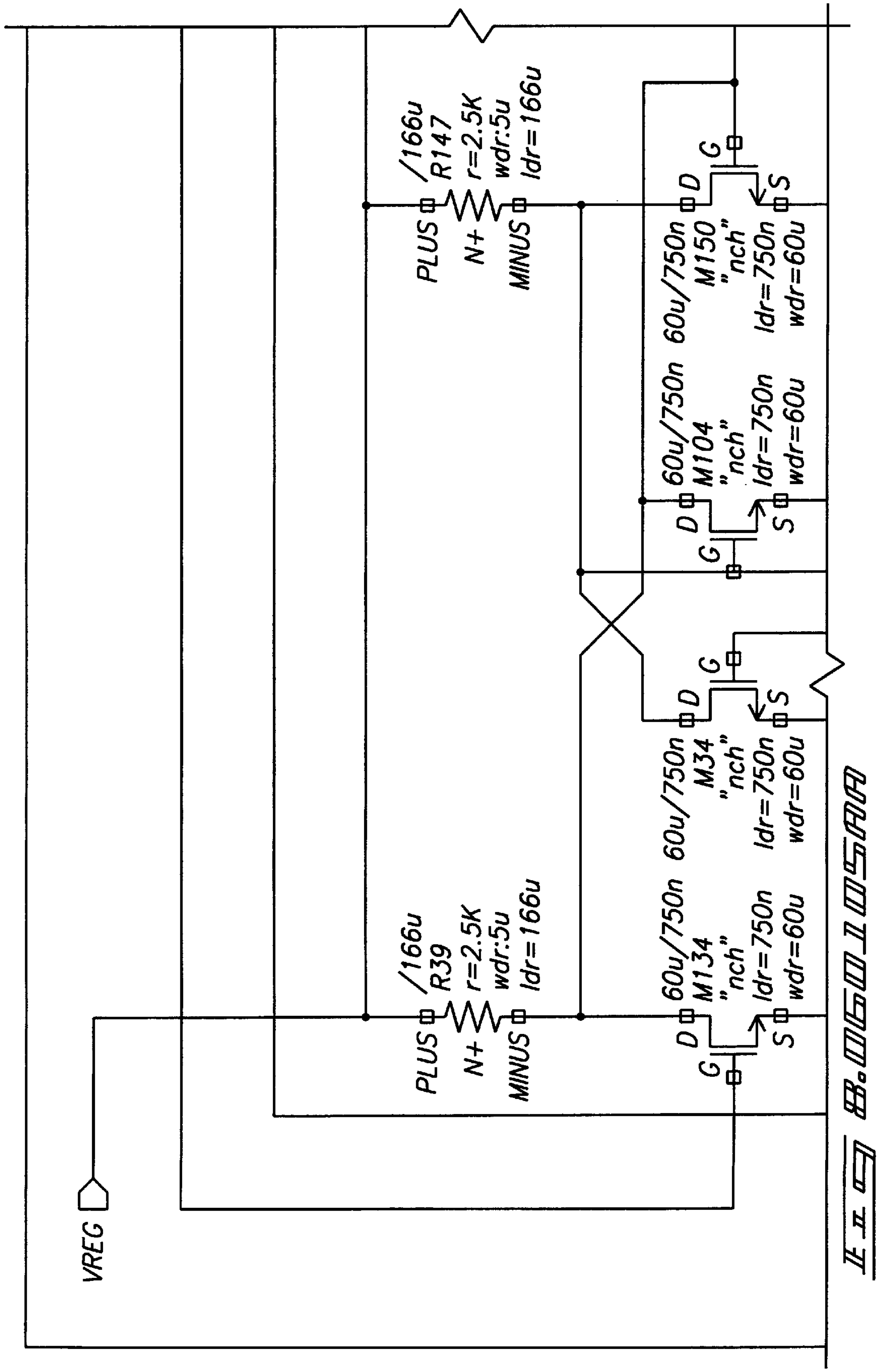
FIG. 8.0601.05AA

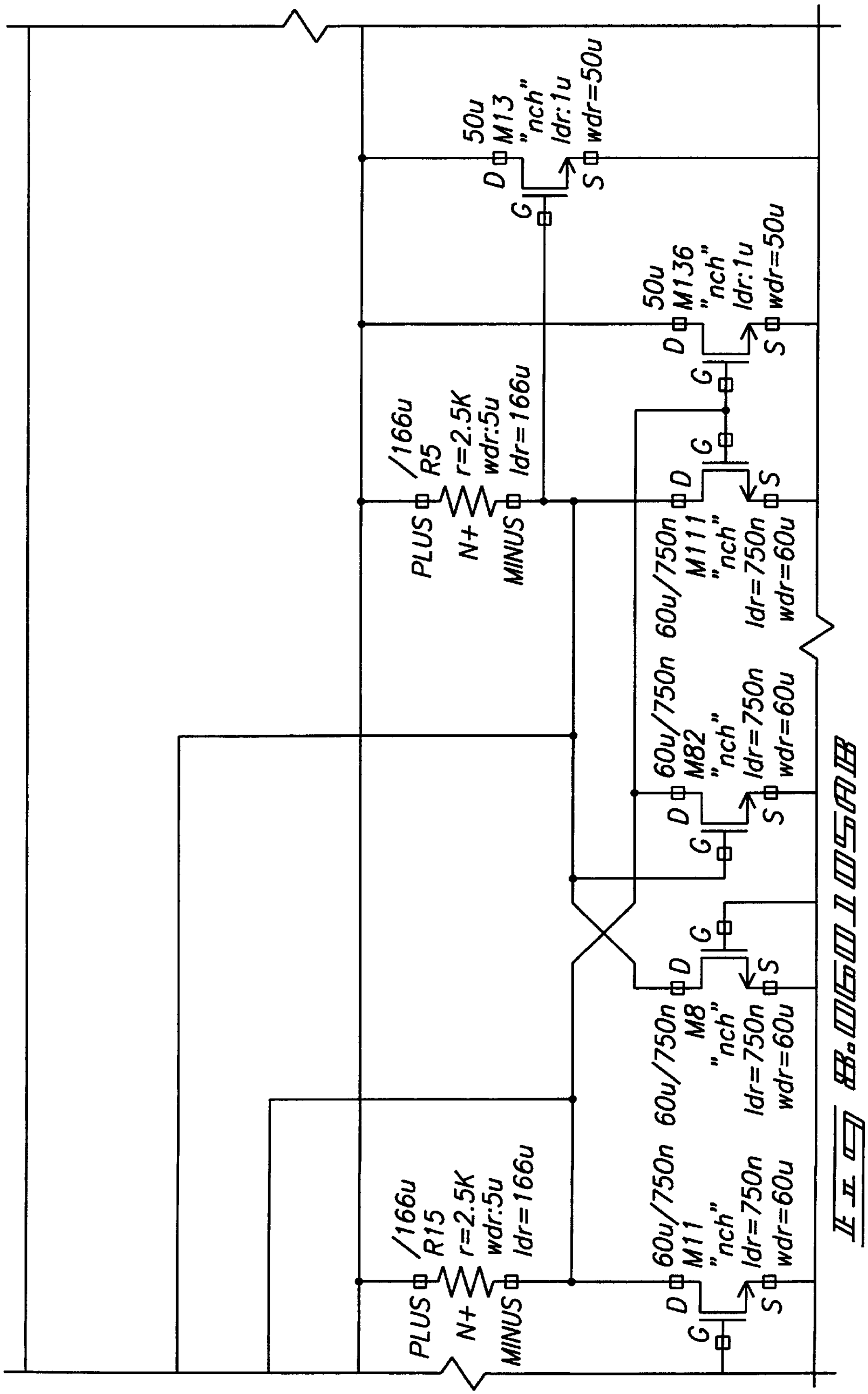
FIG. 8.060105AB

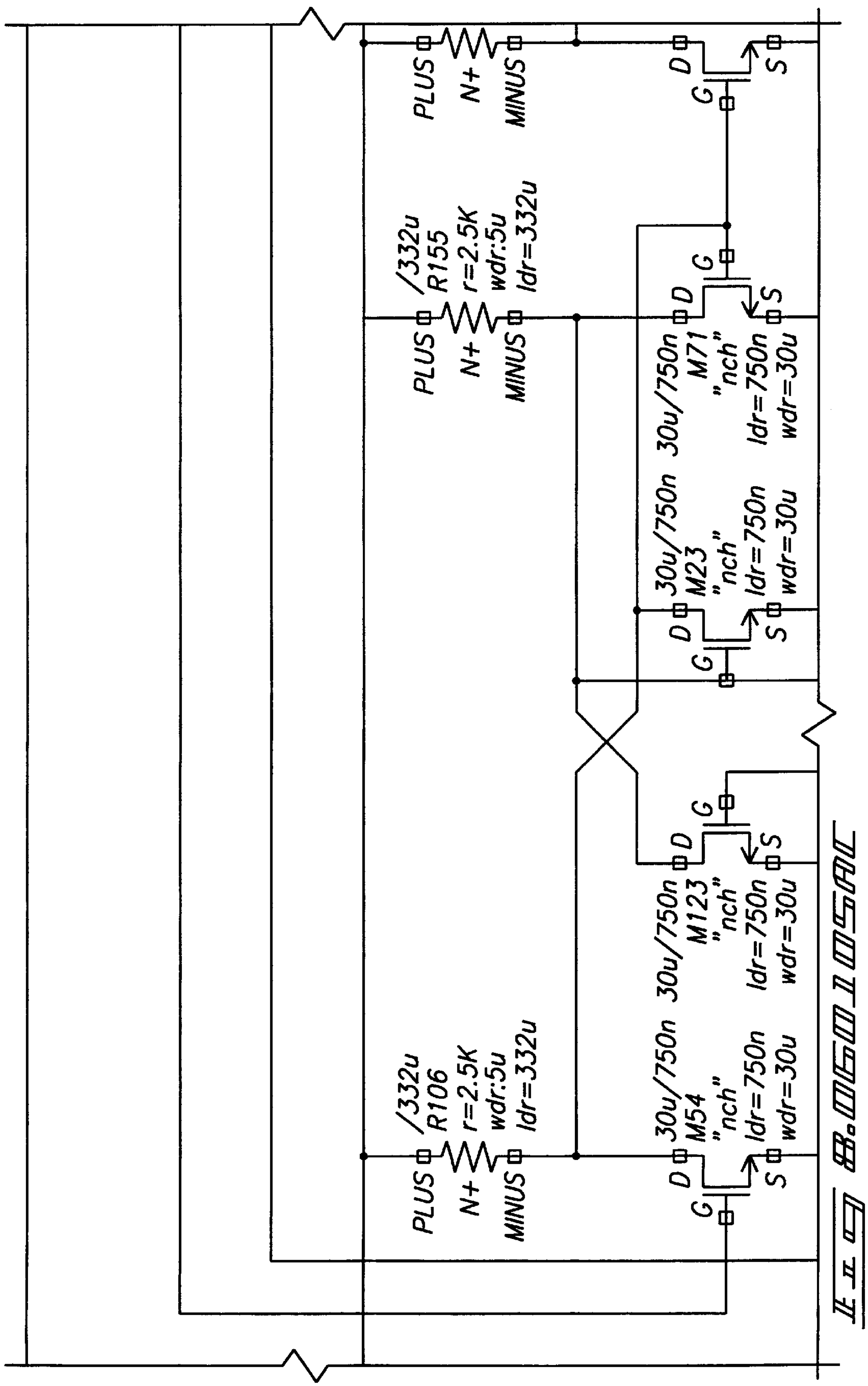
PLUS
N+
MINUS
D
G
S
/332u
R155
r=2.5K
wdr:5u
ldr=332u
30u/750n
M71
"nch"
ldr=750n
wdr=30u
30u/750n
M23
"nch"
ldr=750n
wdr=30u
30u/750n
M123
"nch"
ldr=750n
wdr=30u
/332u
R106
r=2.5K
wdr:5u
ldr=332u
30u/750n
M54
"nch"
ldr=750n
wdr=30u

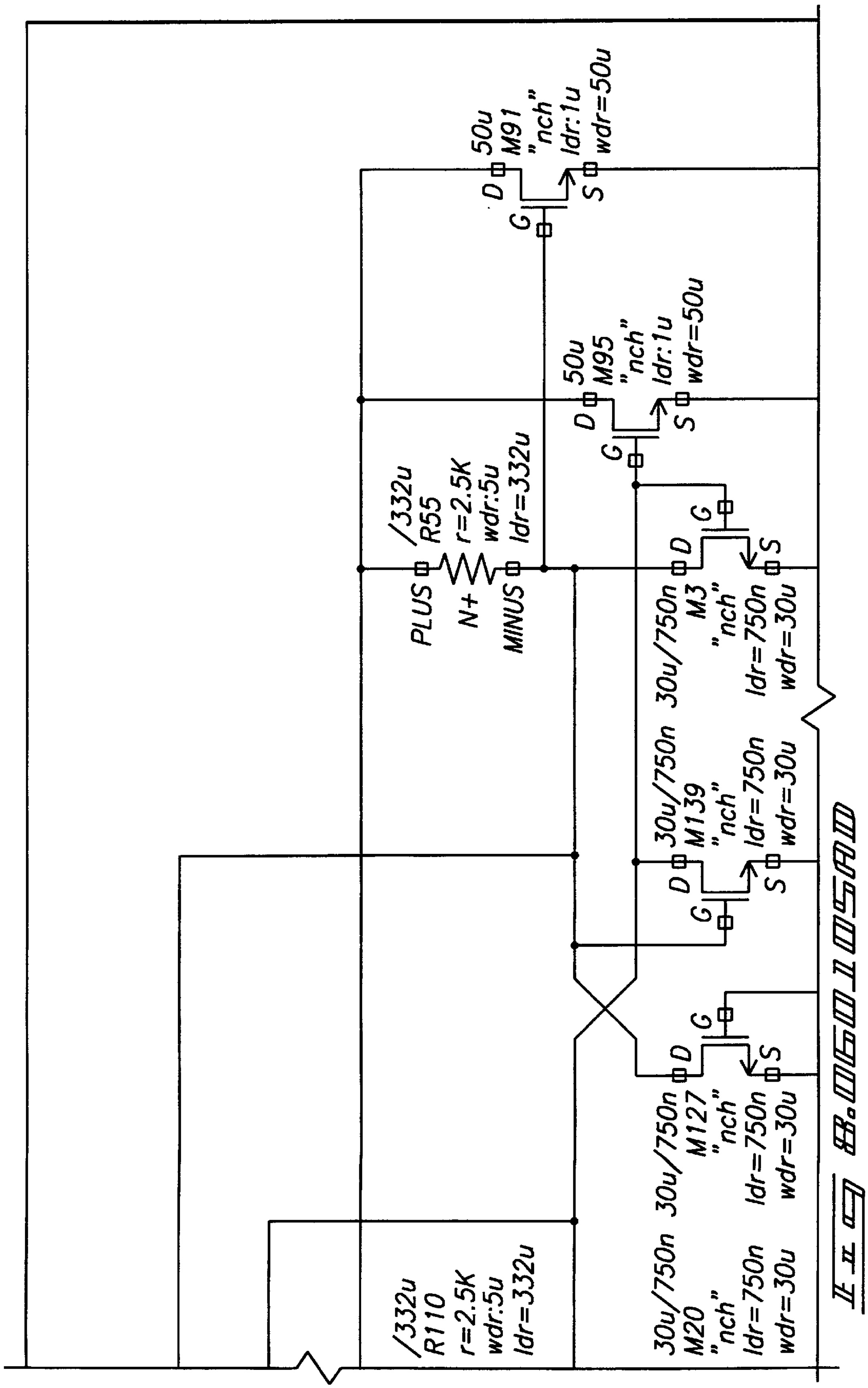
50u
M91
"nch"
ldr:1u
wdr=50u
D
G
S
50u
M95
"nch"
ldr:1u
wdr=50u
/332u
R55
r=2.5K
wdr:5u
ldr=332u
PLUS
N+
MINUS
30u/750n
M3
"nch"
ldr=750n
wdr=30u
30u/750n
M139
"nch"
ldr=750n
wdr=30u
30u/750n
M127
"nch"
ldr=750n
wdr=30u
30u/750n
M20
"nch"
ldr=750n
wdr=30u
/332u
R110
r=2.5K
wdr:5u
ldr=332u

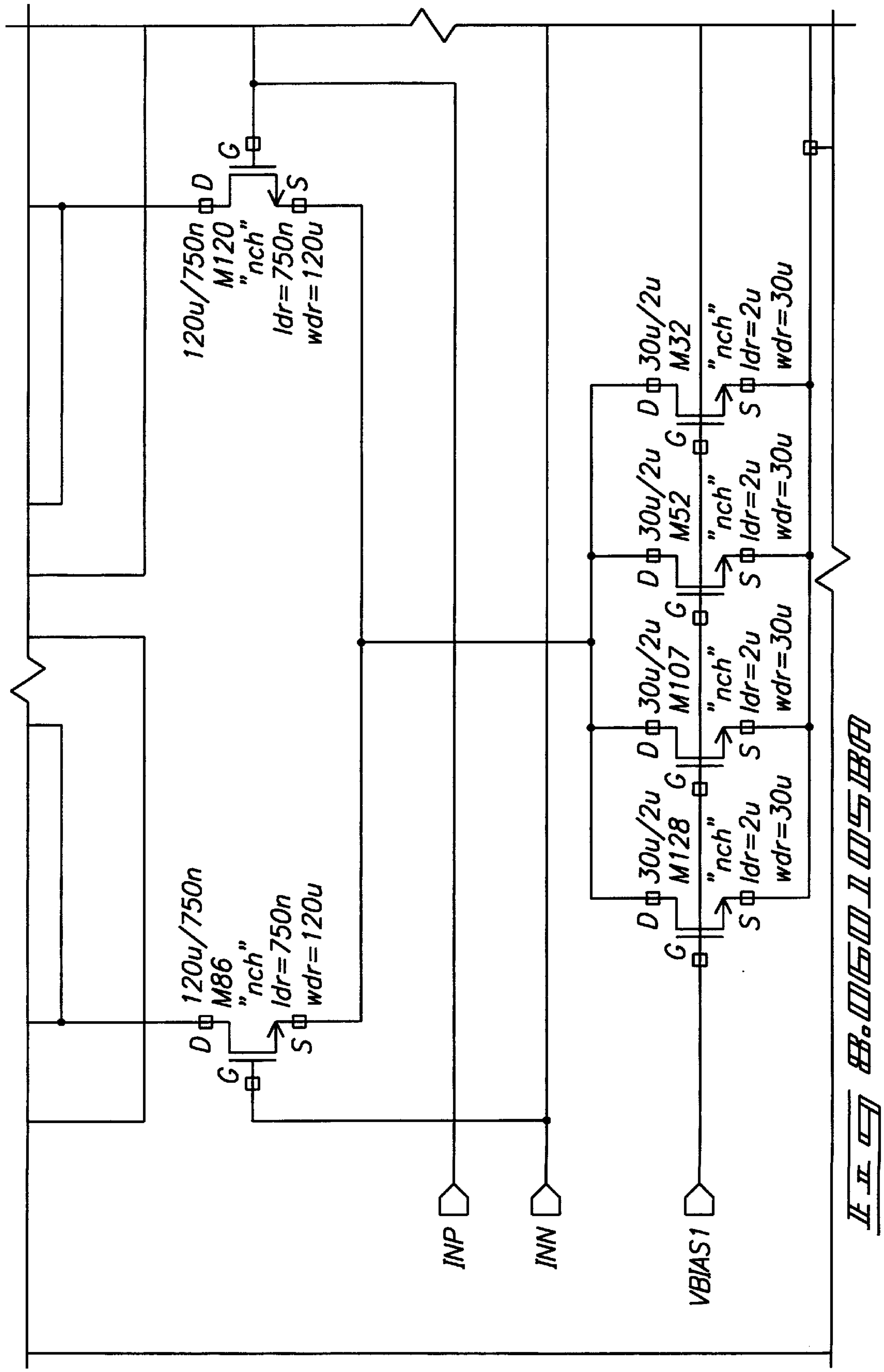
Fig. 8.060.105BA

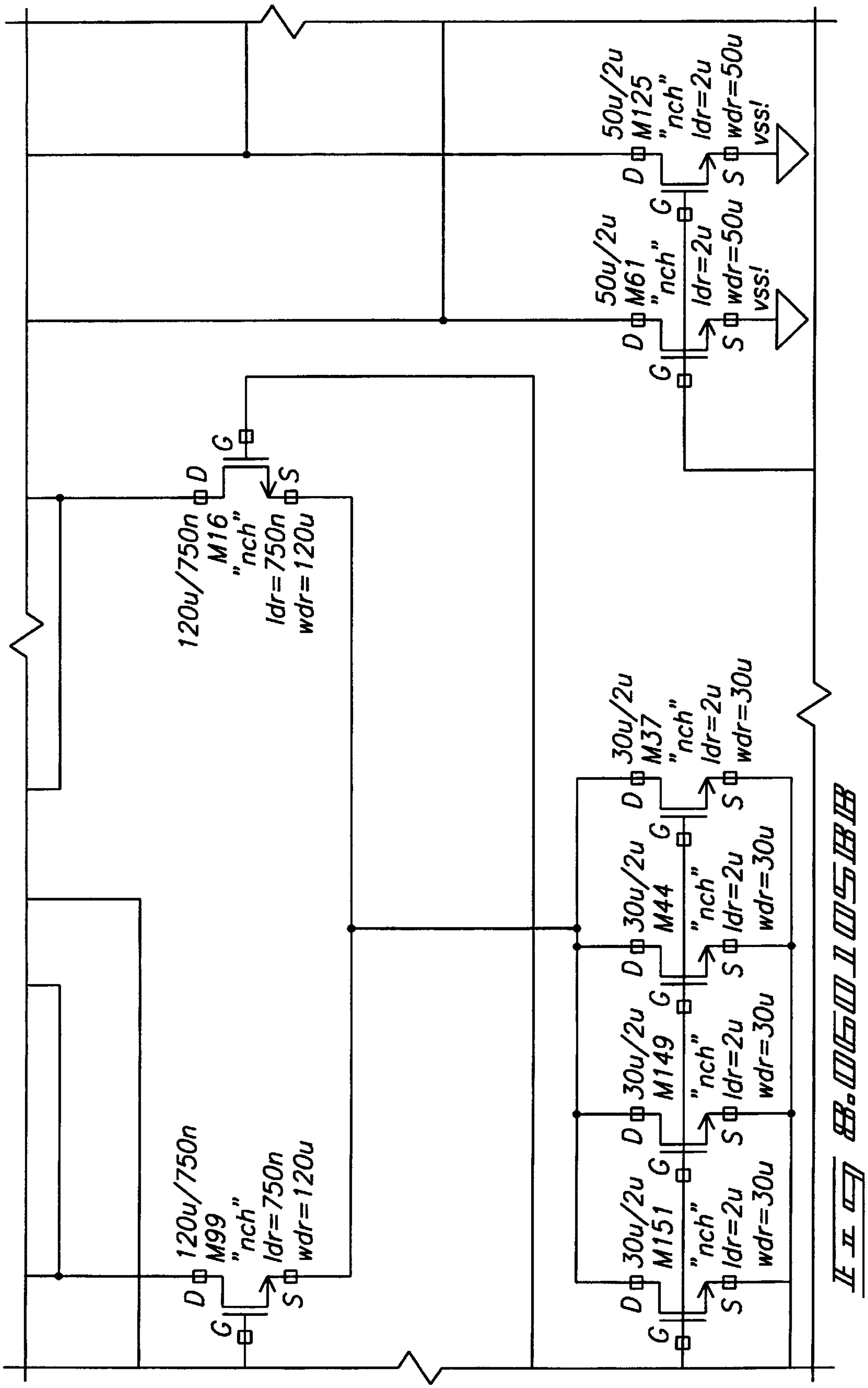
FIG. 8.060105B

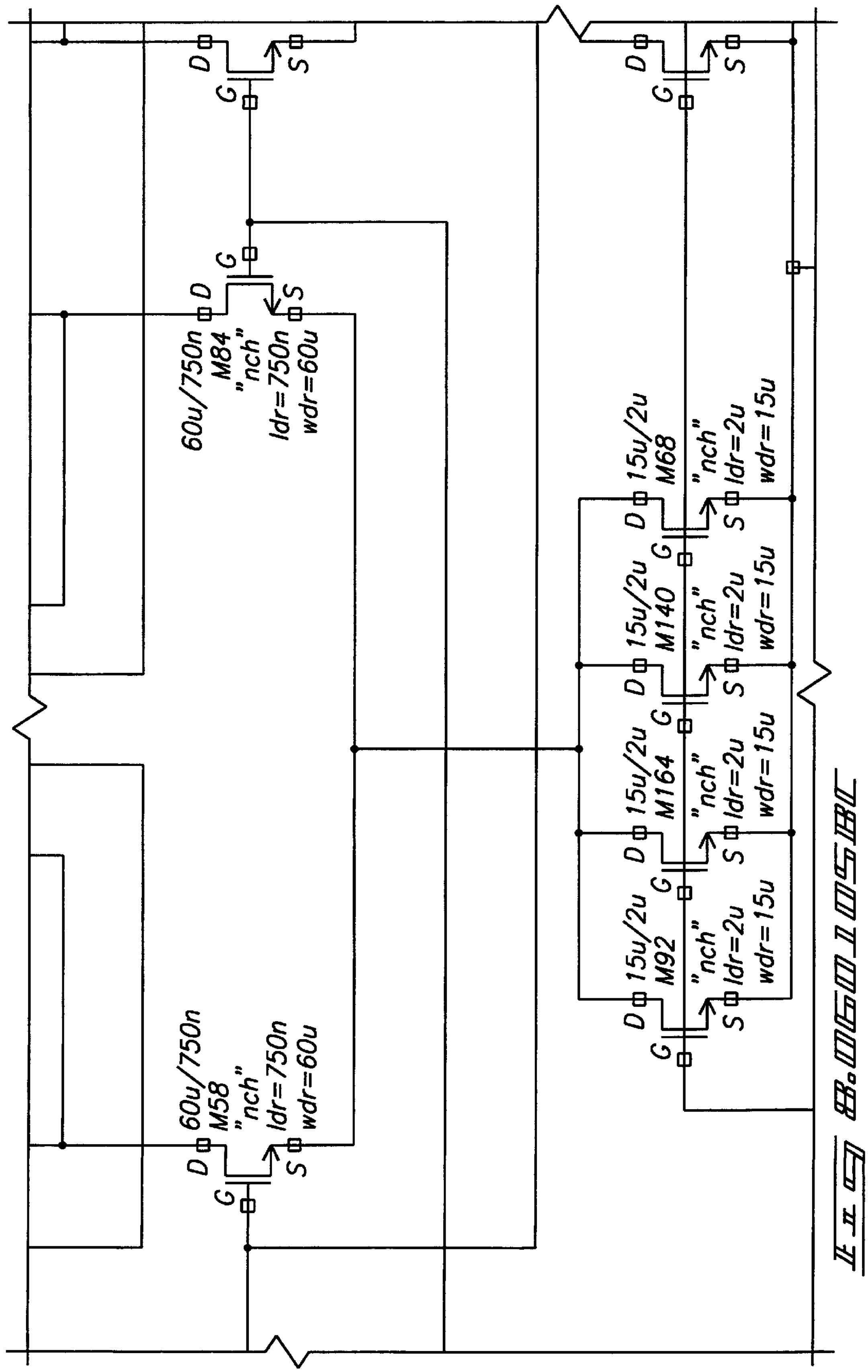
60u/750n
M84
"nch"
ldr=750n
wdr=60u
60u/750n
M58
"nch"
ldr=750n
wdr=60u
15u/2u
M68
"nch"
ldr=2u
wdr=15u
15u/2u
M140
"nch"
ldr=2u
wdr=15u
15u/2u
M164
"nch"
ldr=2u
wdr=15u
15u/2u
M92
"nch"
ldr=2u
wdr=15u

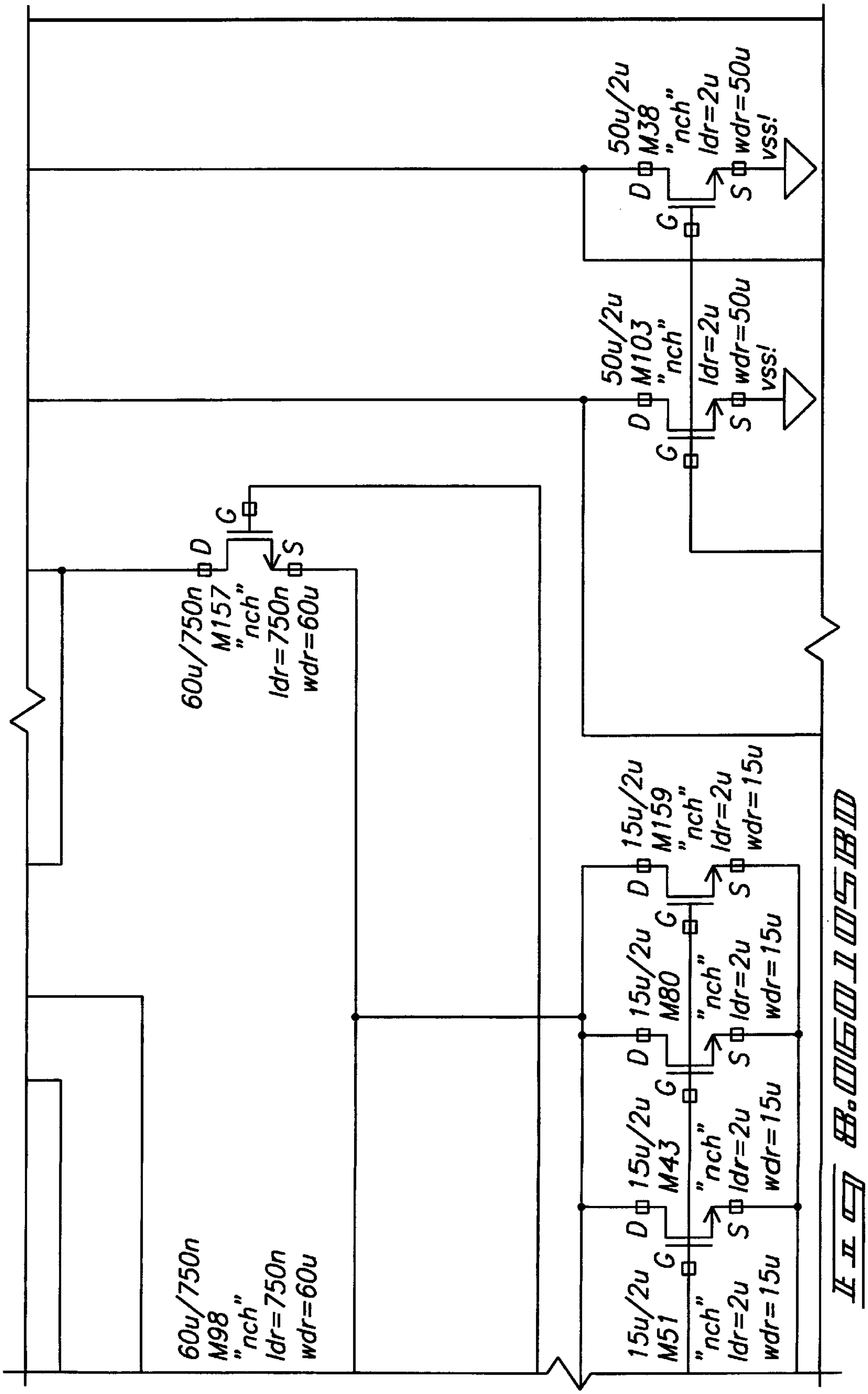
FIG. 8.060105BD

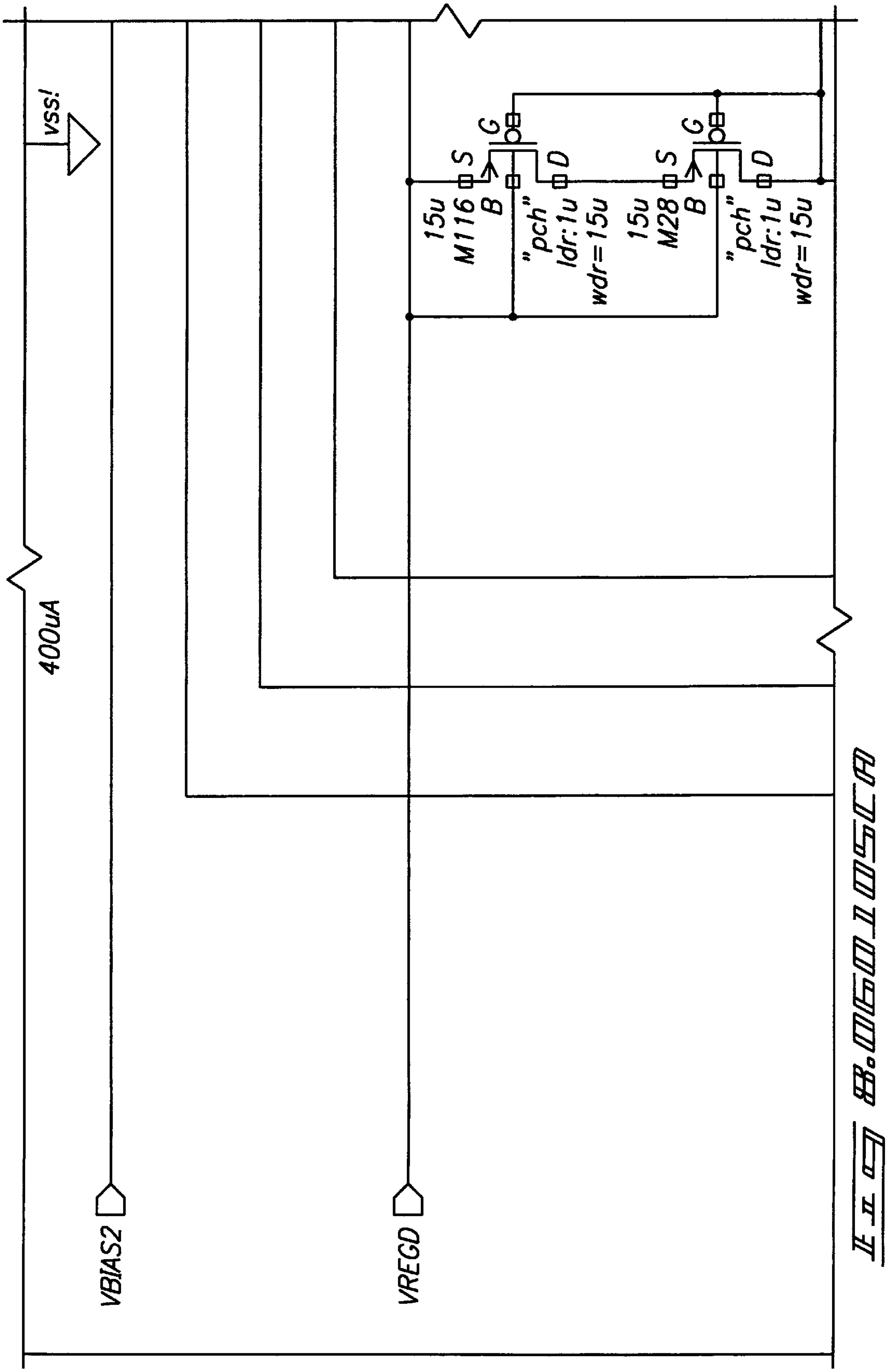
Fig. 8.06010SCA

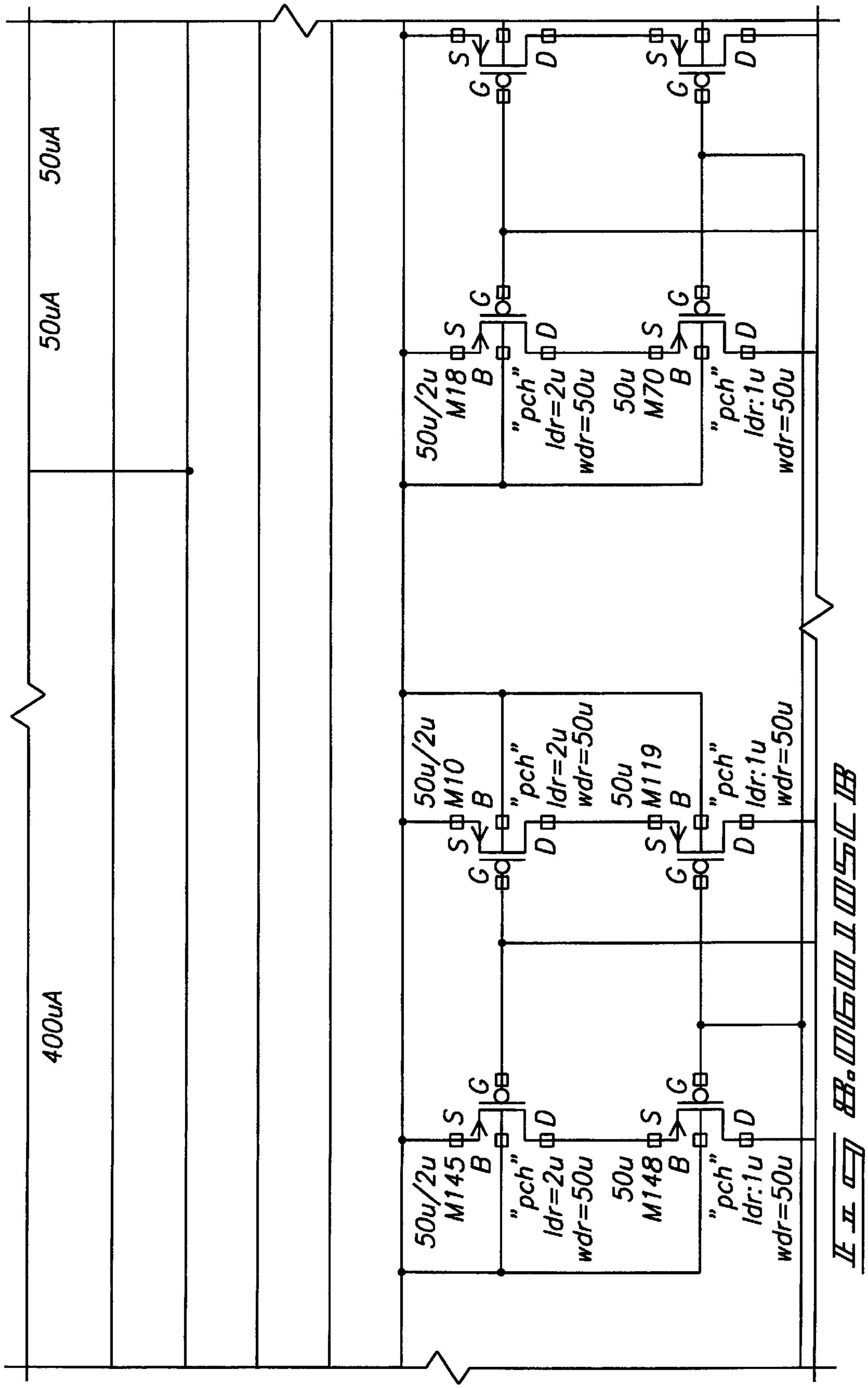
FIG. 8.060105CB

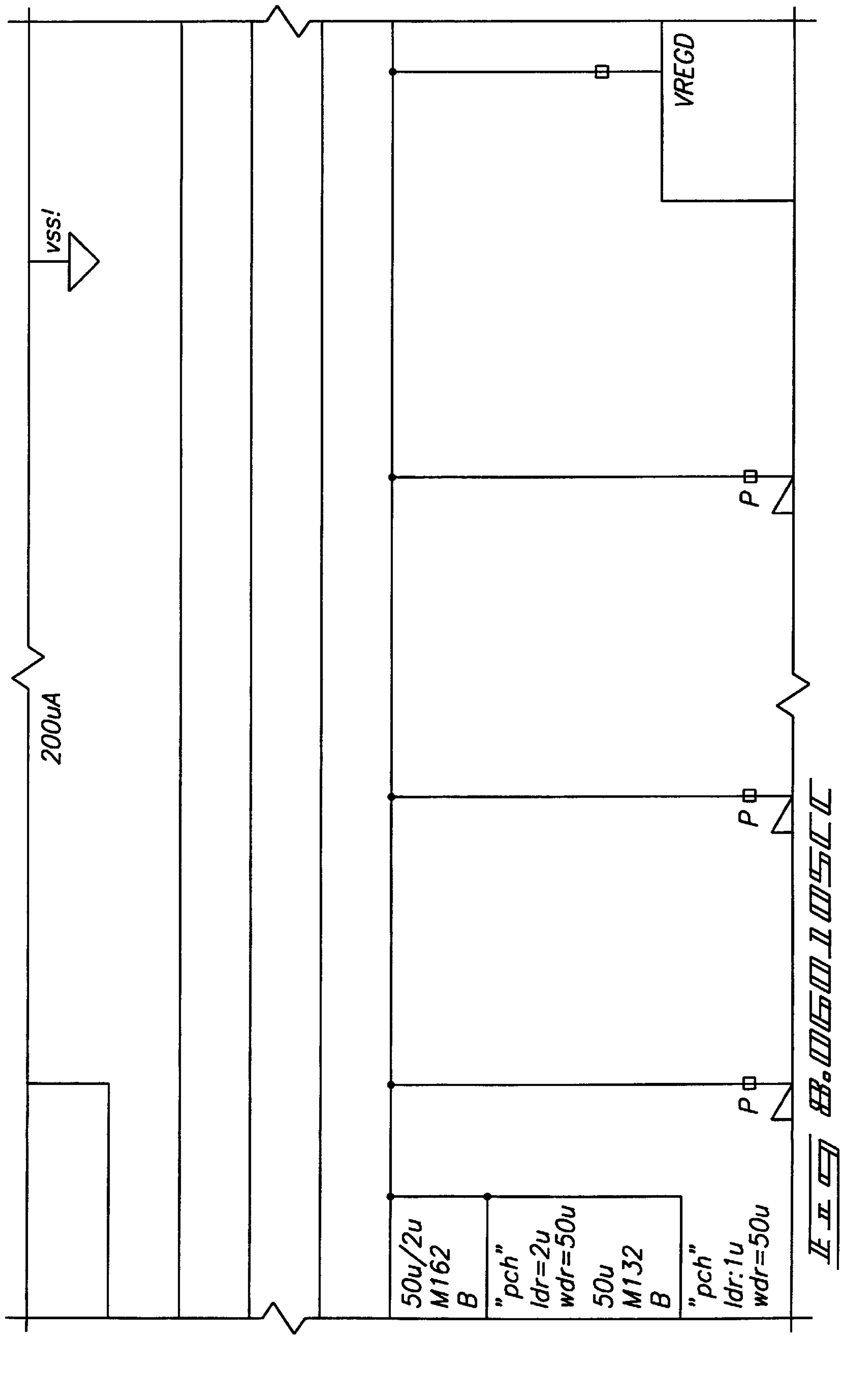
Fig 8.060105CC

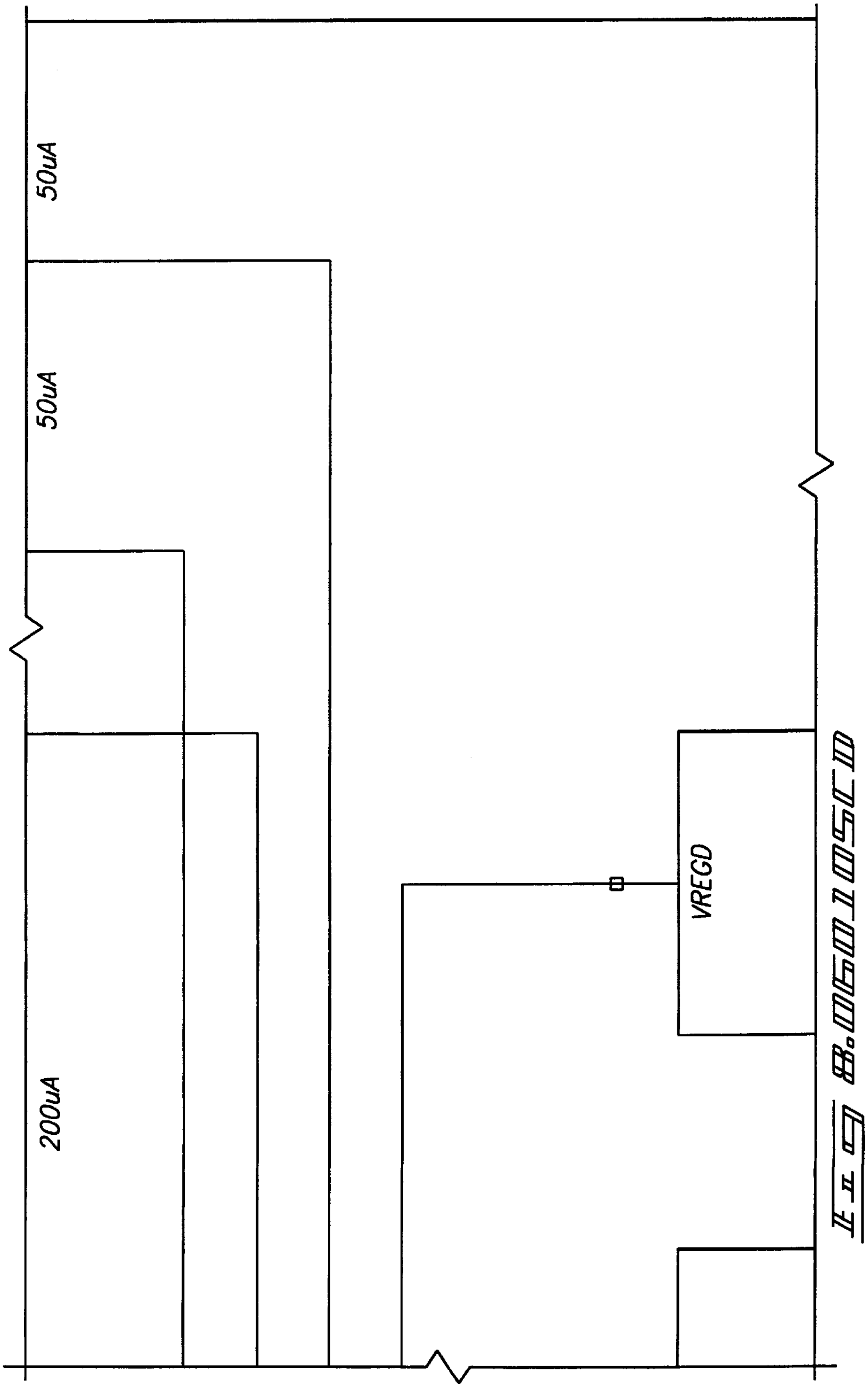
Fig 8.060105CD

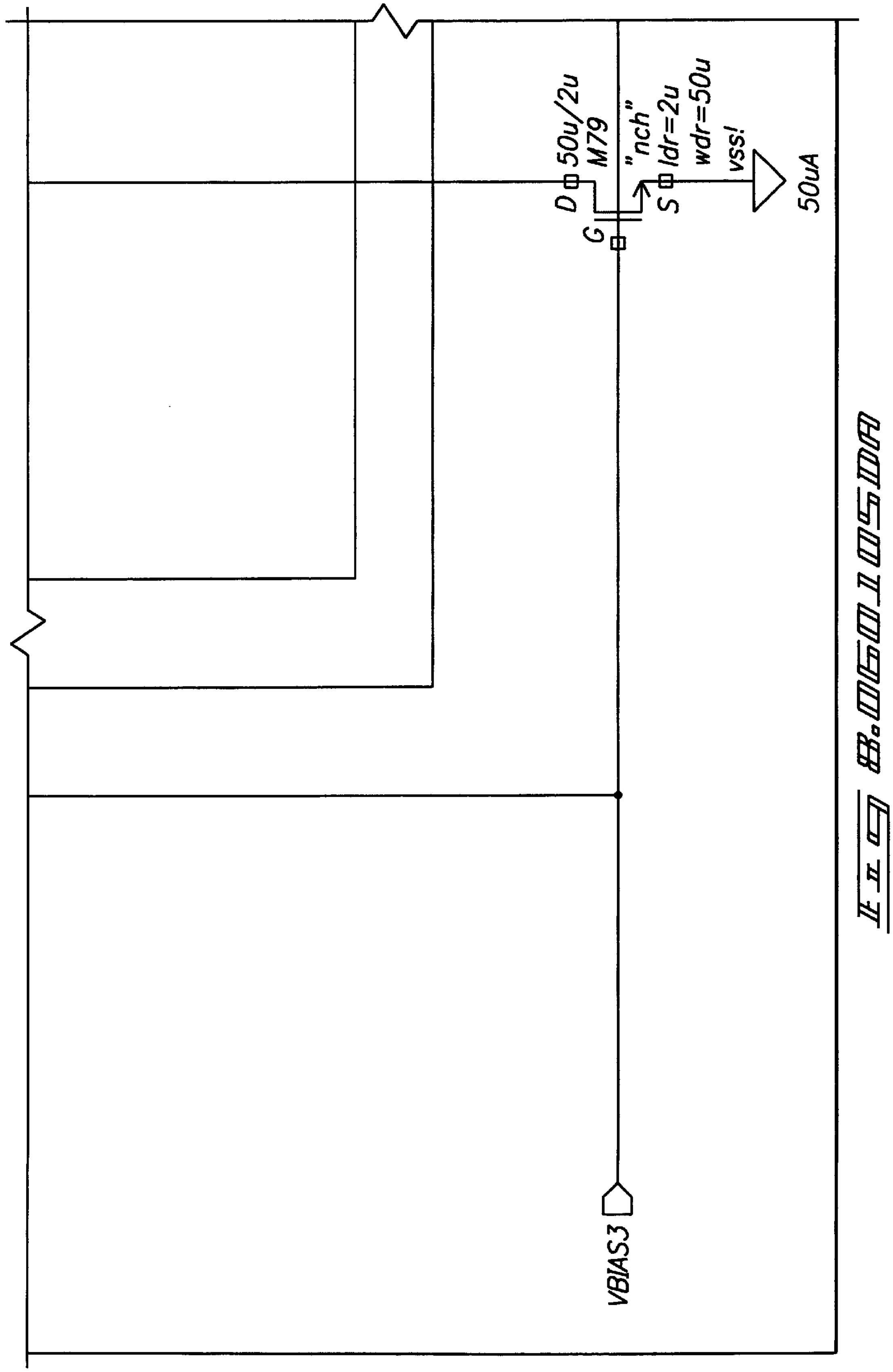
FIG. 8.060105DA

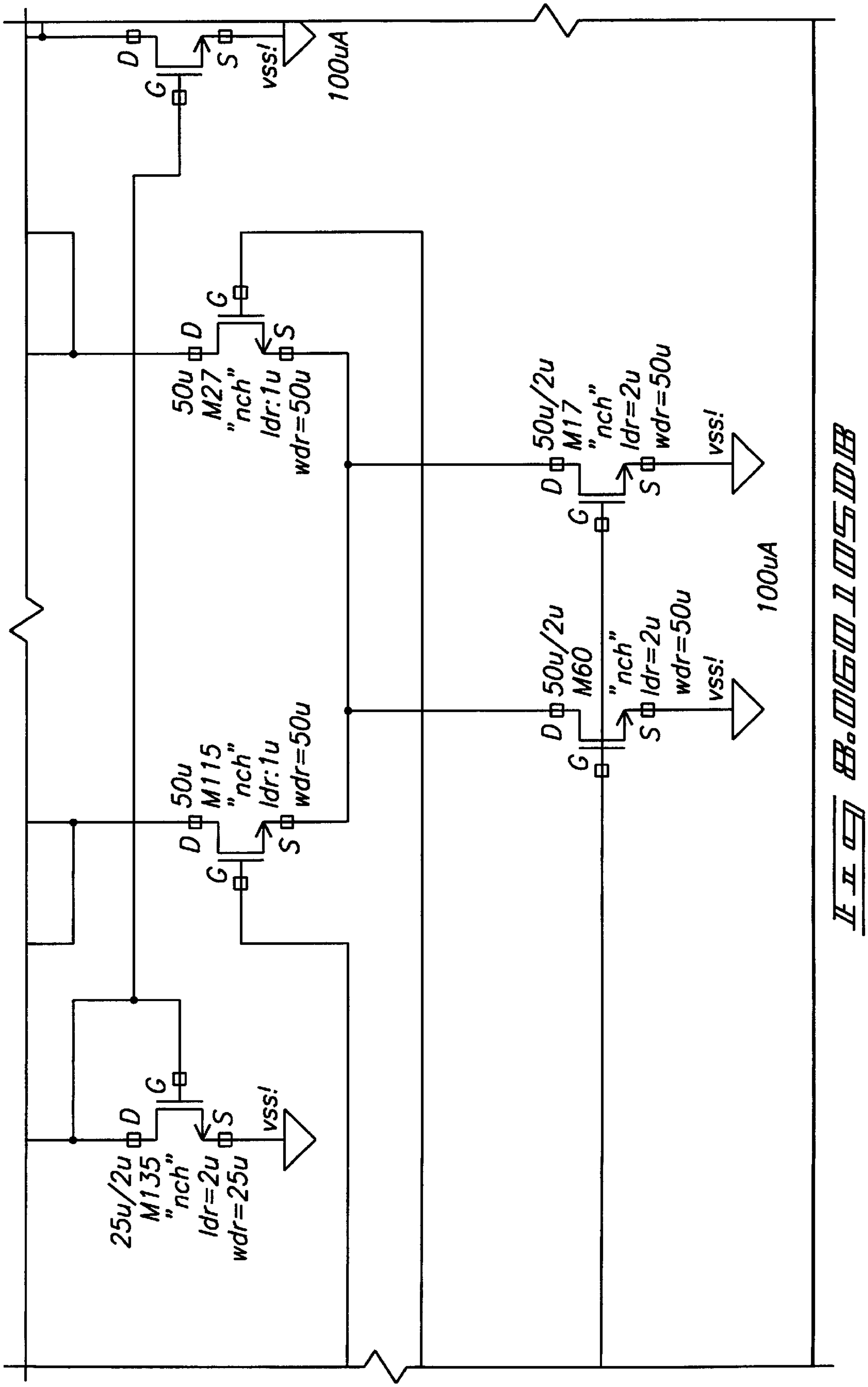
Fig 8.060105DB

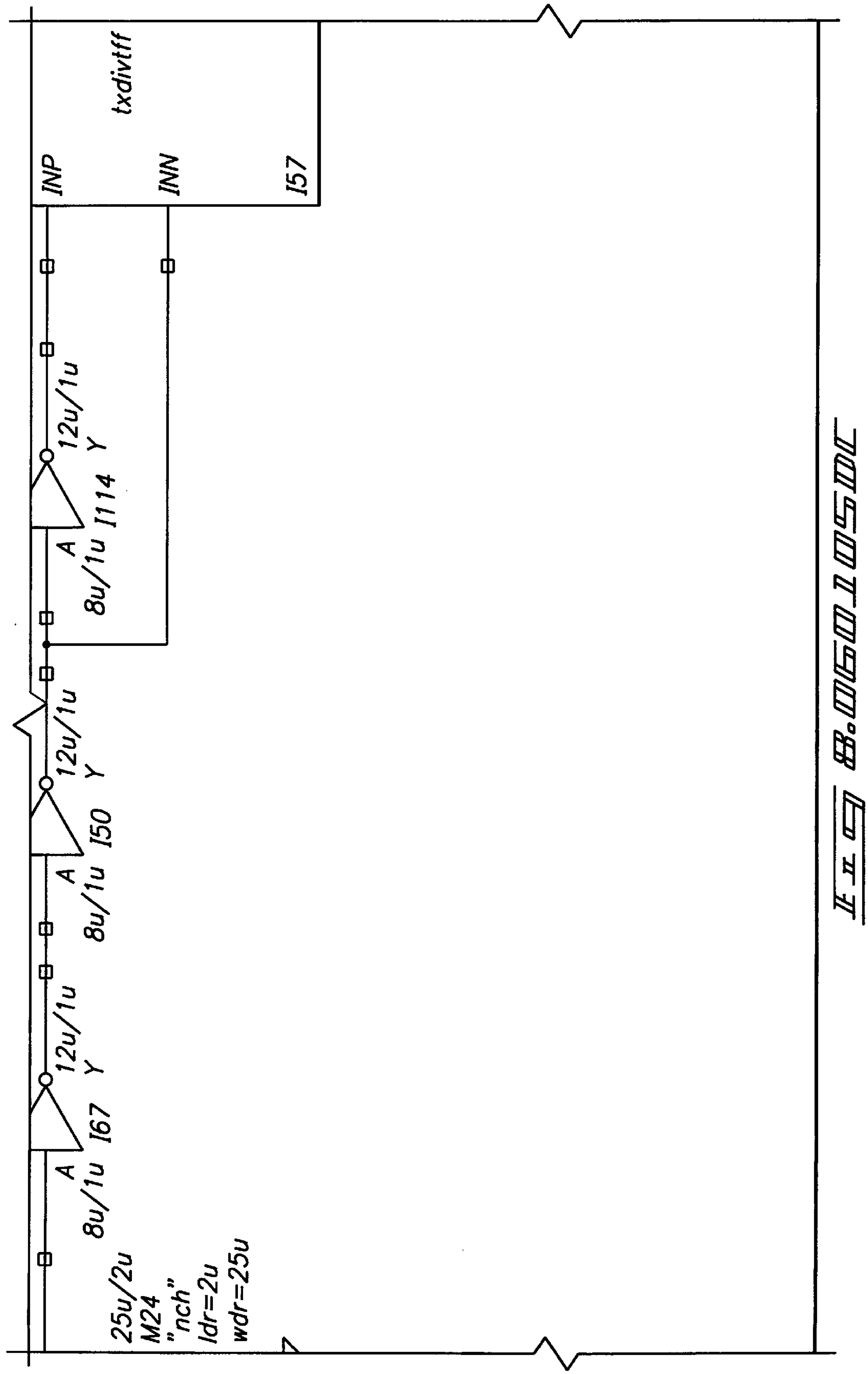
Fig. 8.060105DC

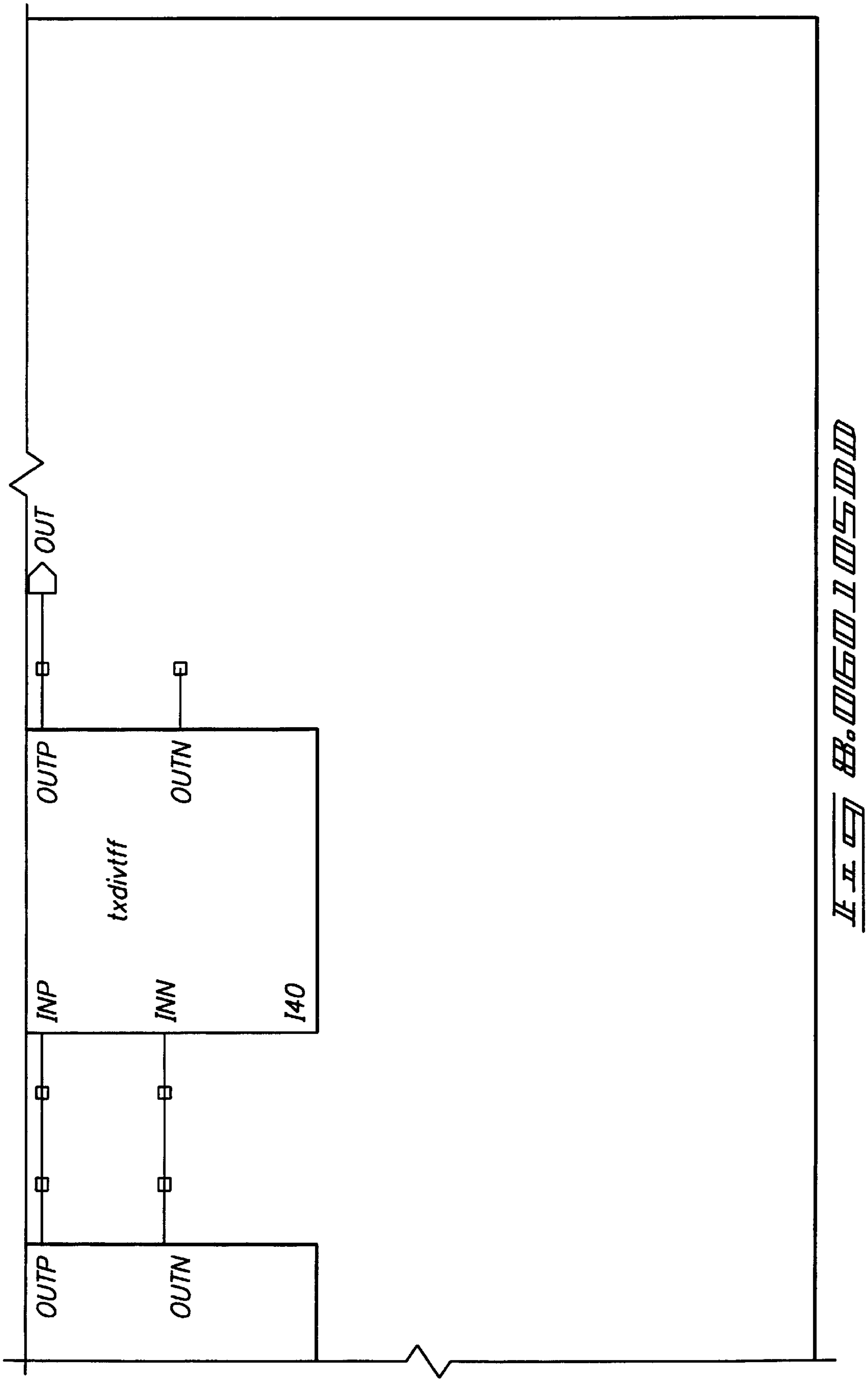
Fig. 8.060105DD

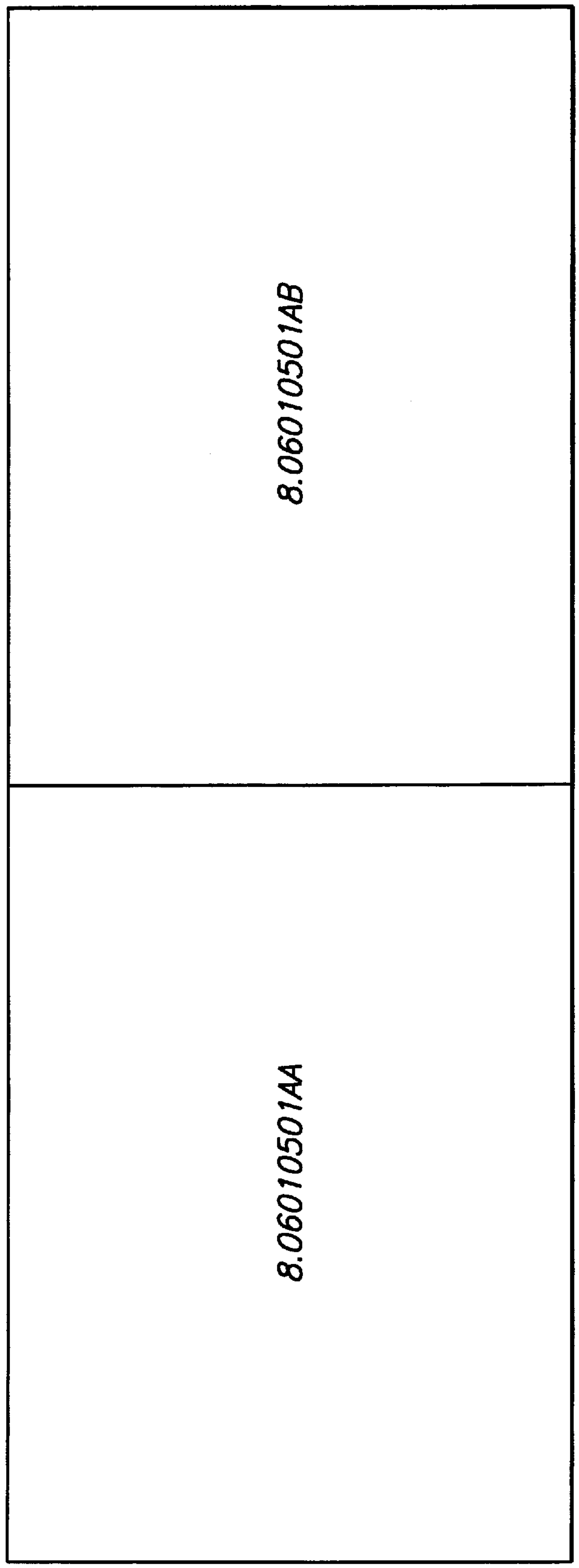
FIG. 8.06010501

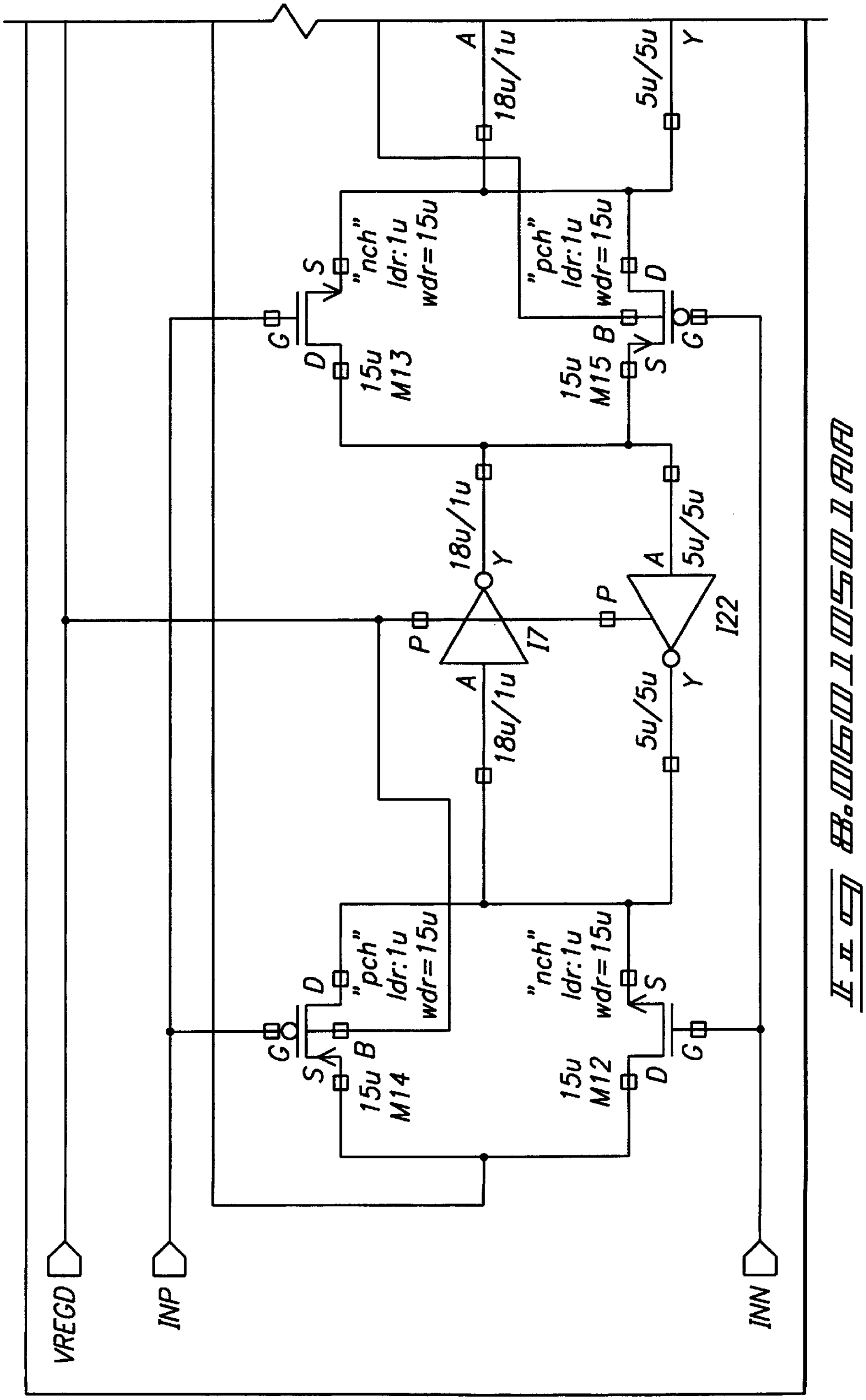
FIG. 8.06010501AA

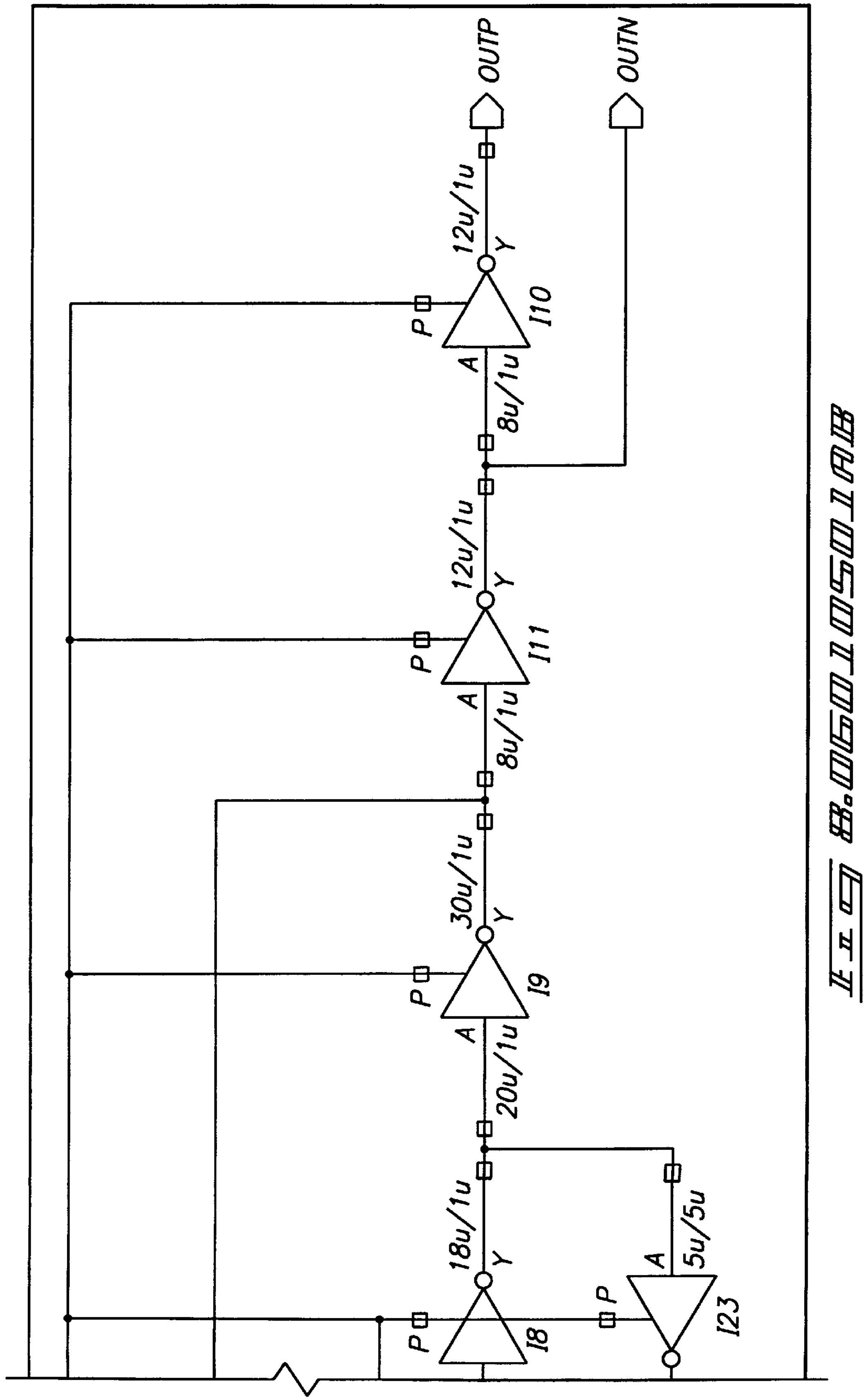
FIG. 8.06010501AB

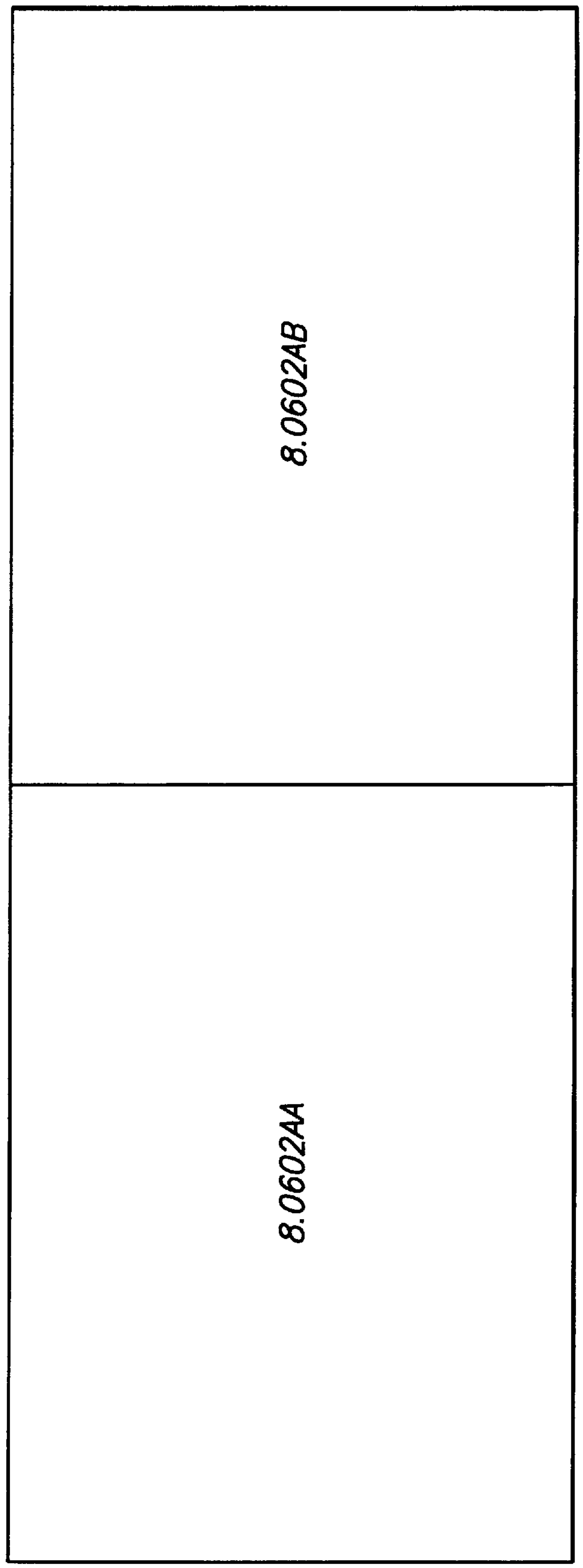
Fig. 8.0602

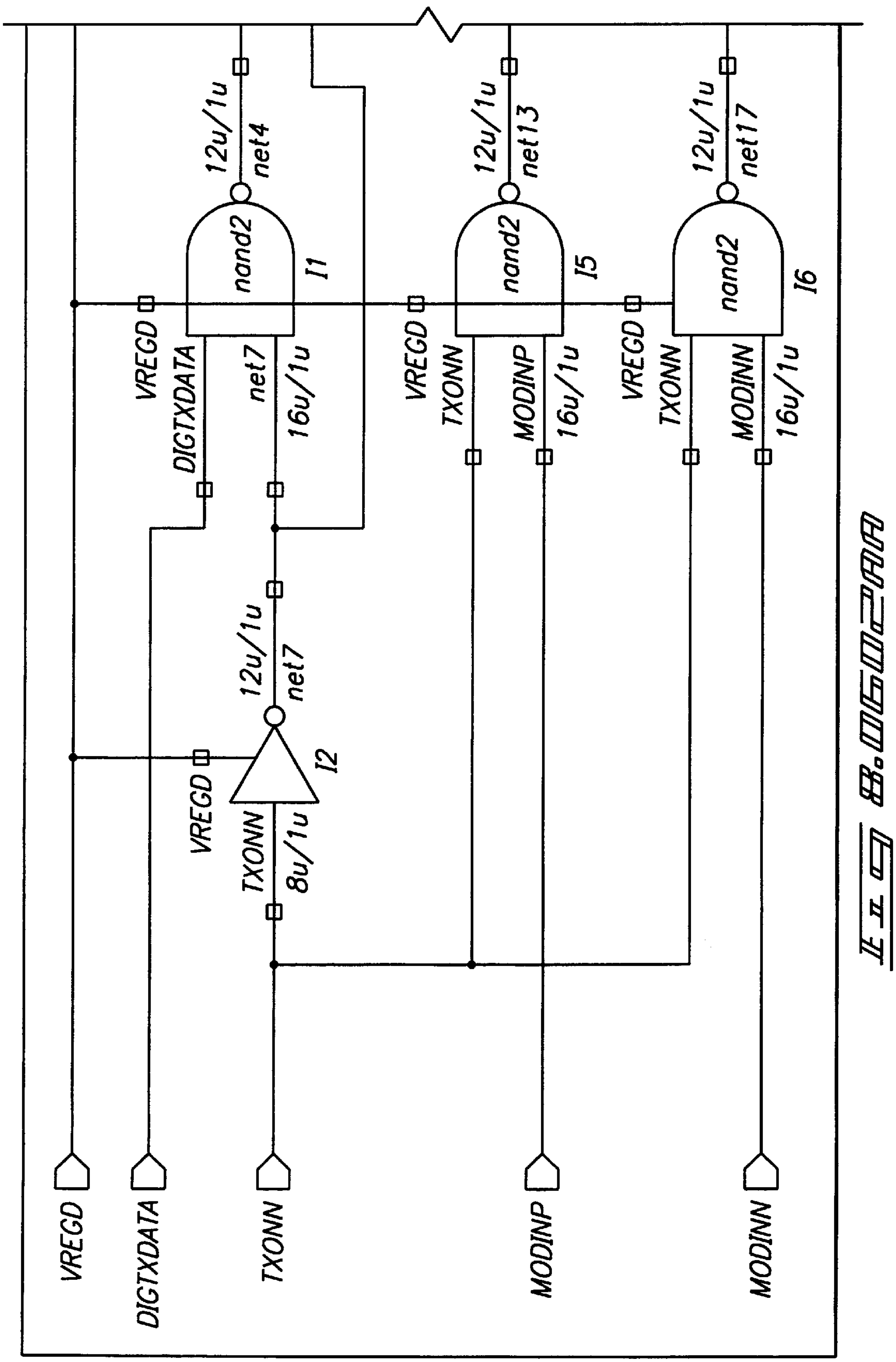
FIG. 8.0060AA

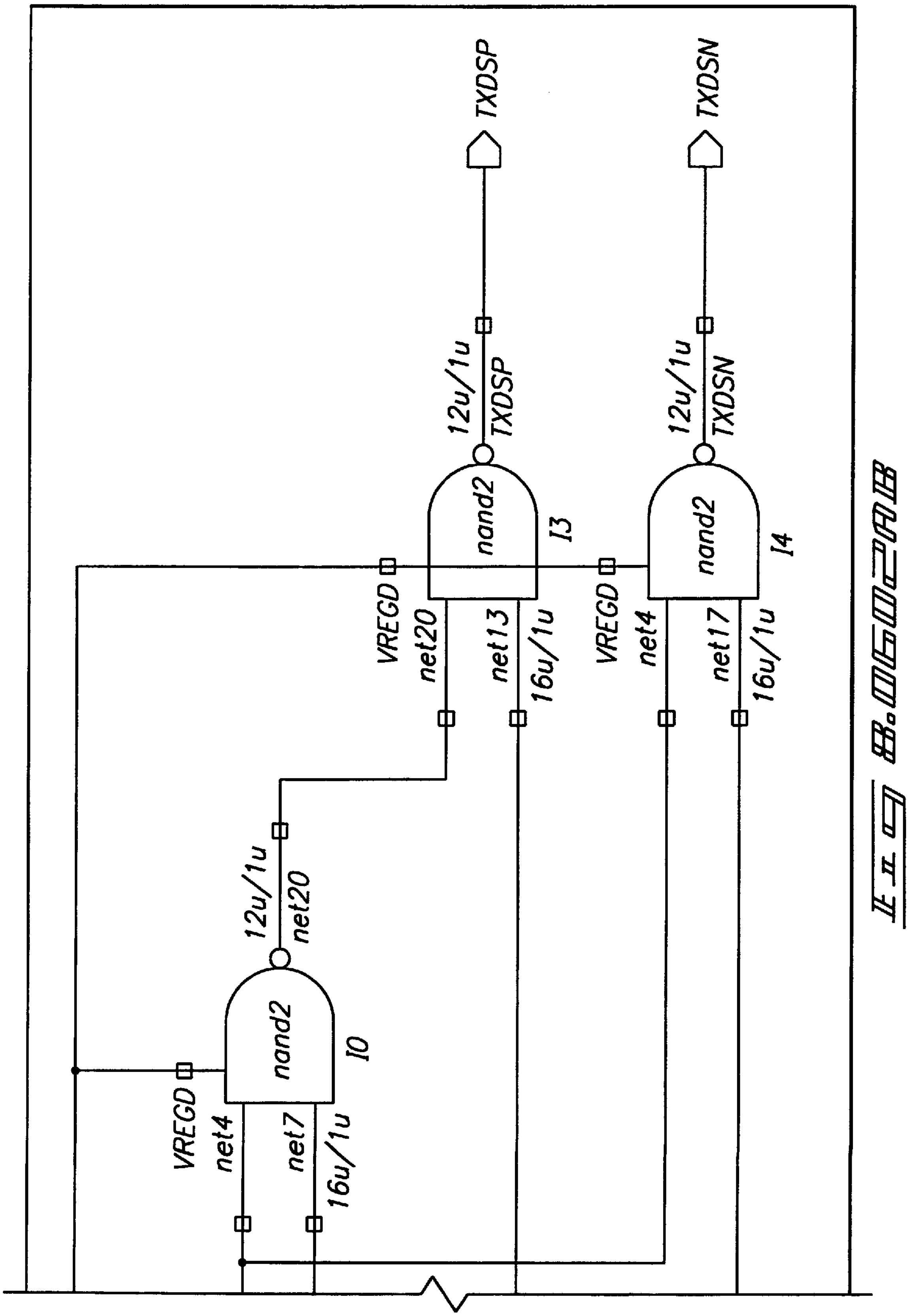
FIG. 8.0602AB

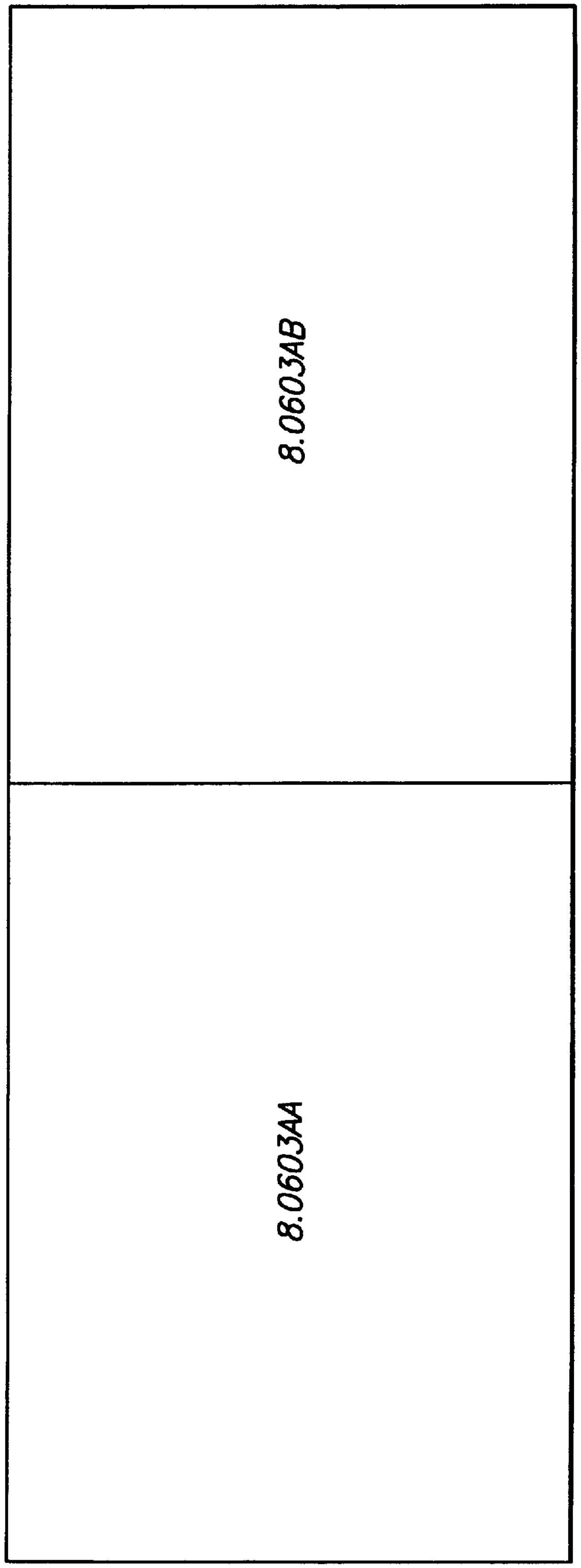
FIG. 8.0603

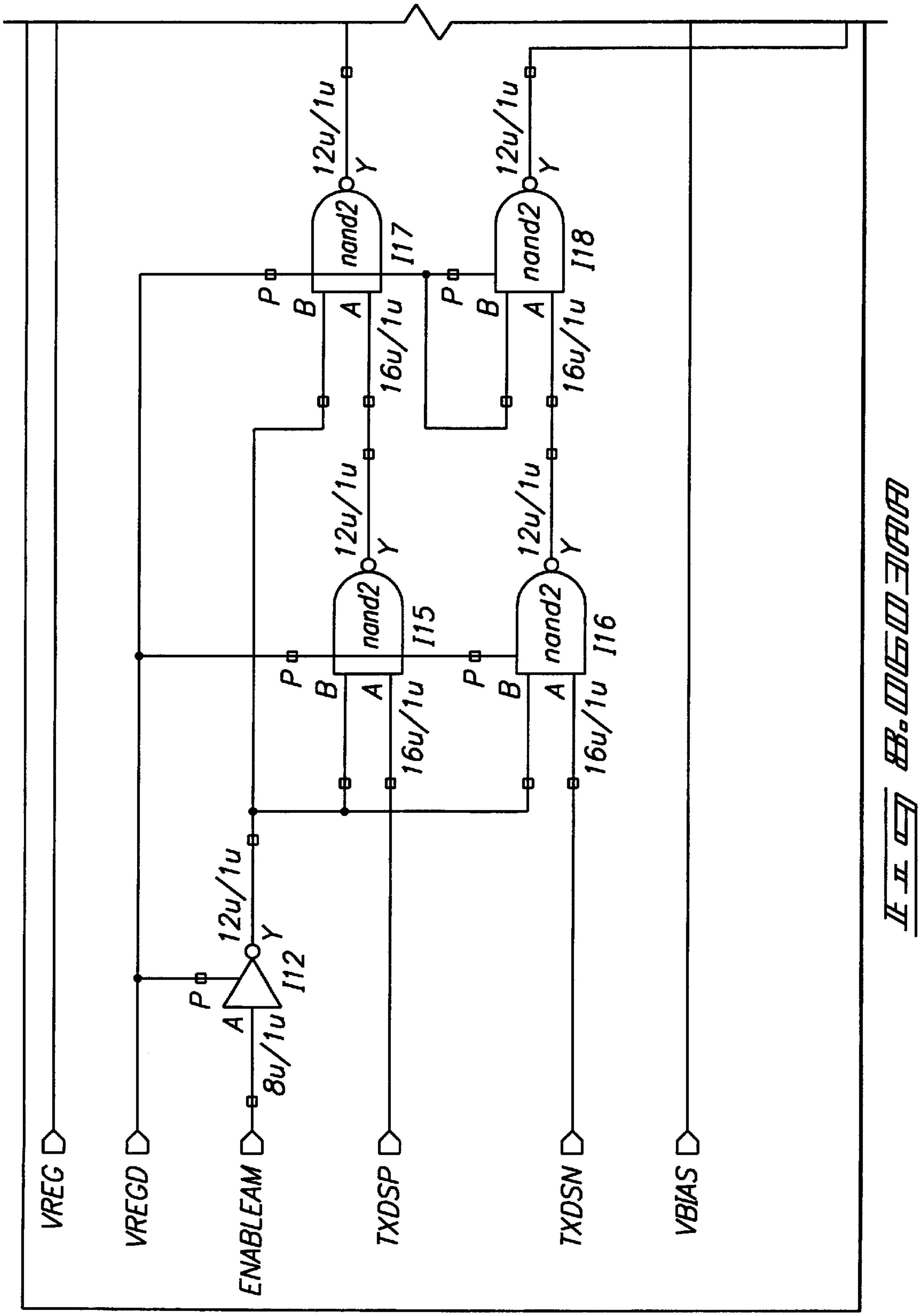
FIG. 8.0G03AA

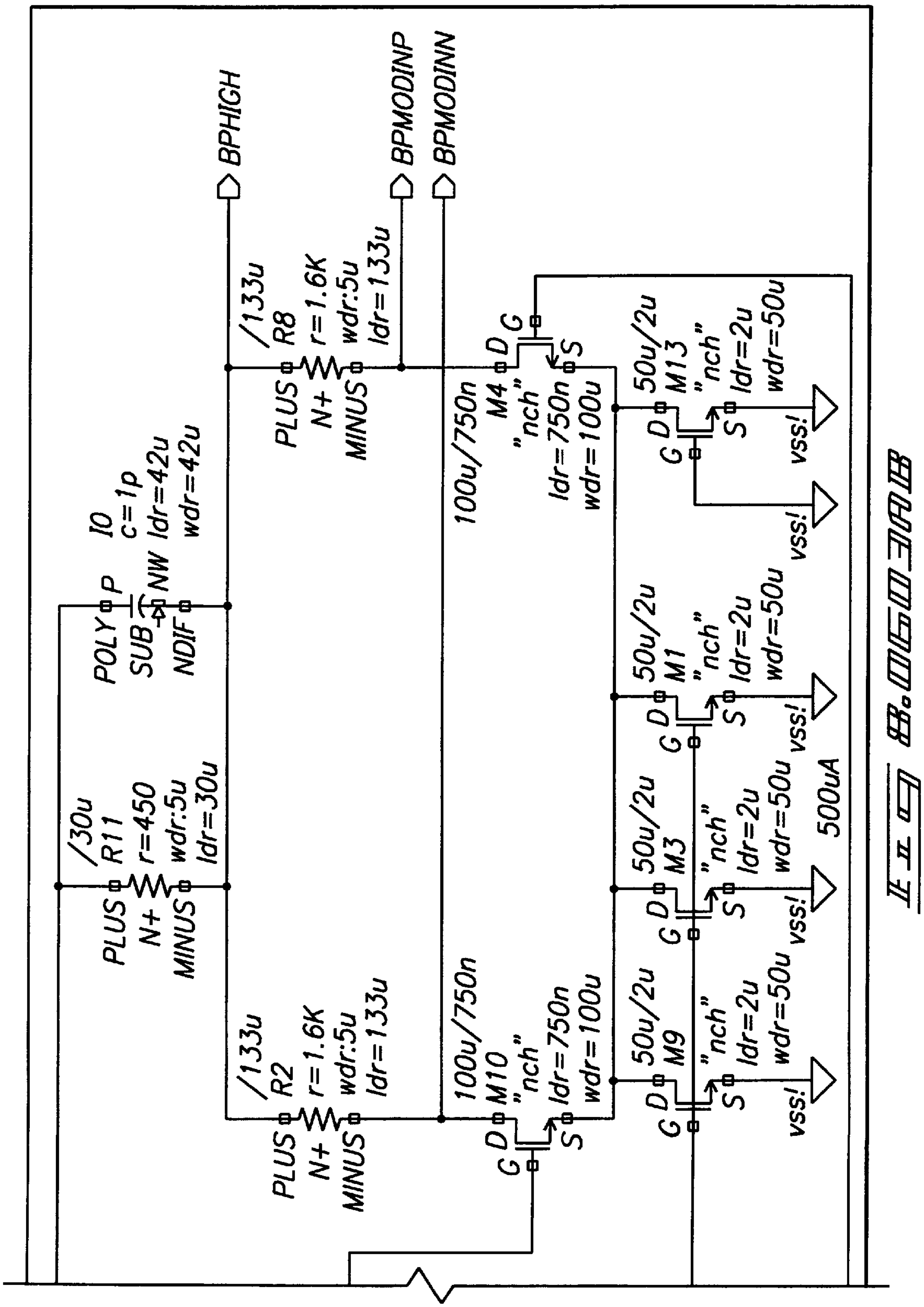
BPHIGH
BPMODINP
BPMODINN
R8
r=1.6K
wdr:5u
ldr=133u
/133u
PLUS
N+
MINUS
M4
"nch"
100u/750n
ldr=750n
wdr=100u
M13
50u/2u
ldr=2u
wdr=50u
vss!
I0
c=1p
ldr=42u
wdr=42u
POLY
SUB
NDIF
NW
M1
M3
M9
500uA
R11
r=450
wdr:5u
ldr=30u
/30u
R2
M10

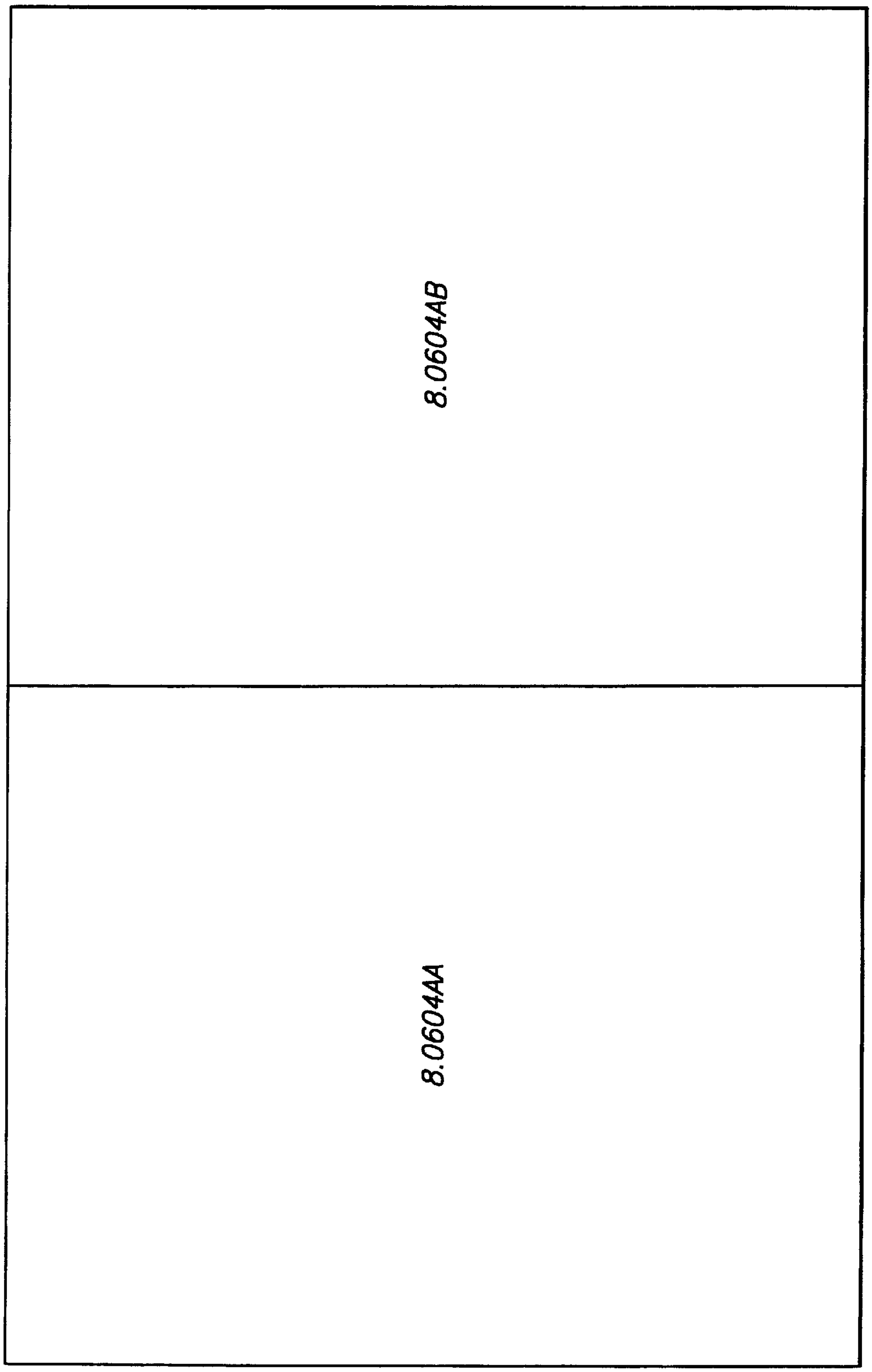
Fig. 8.0604

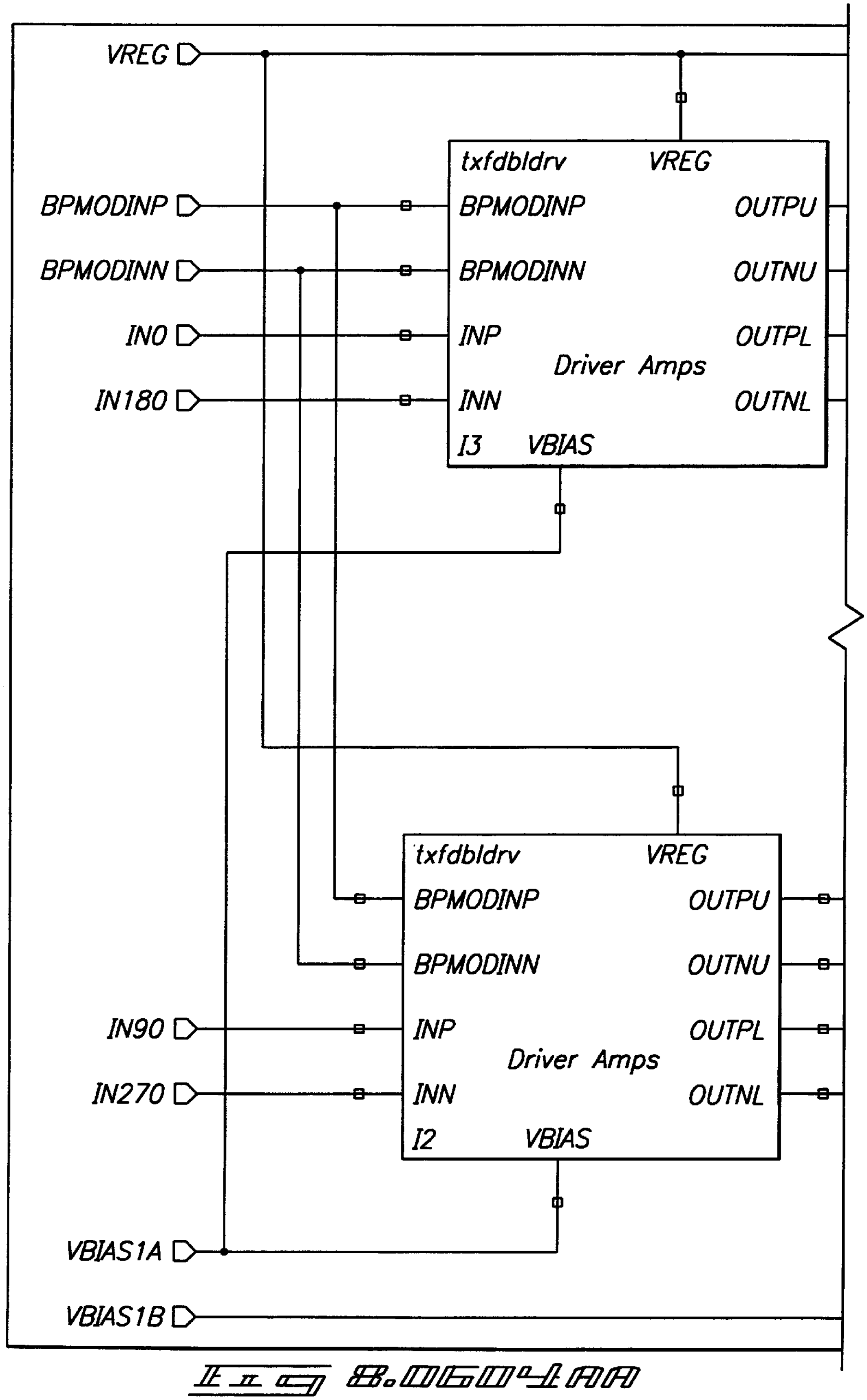
Fig. 8.0604AA

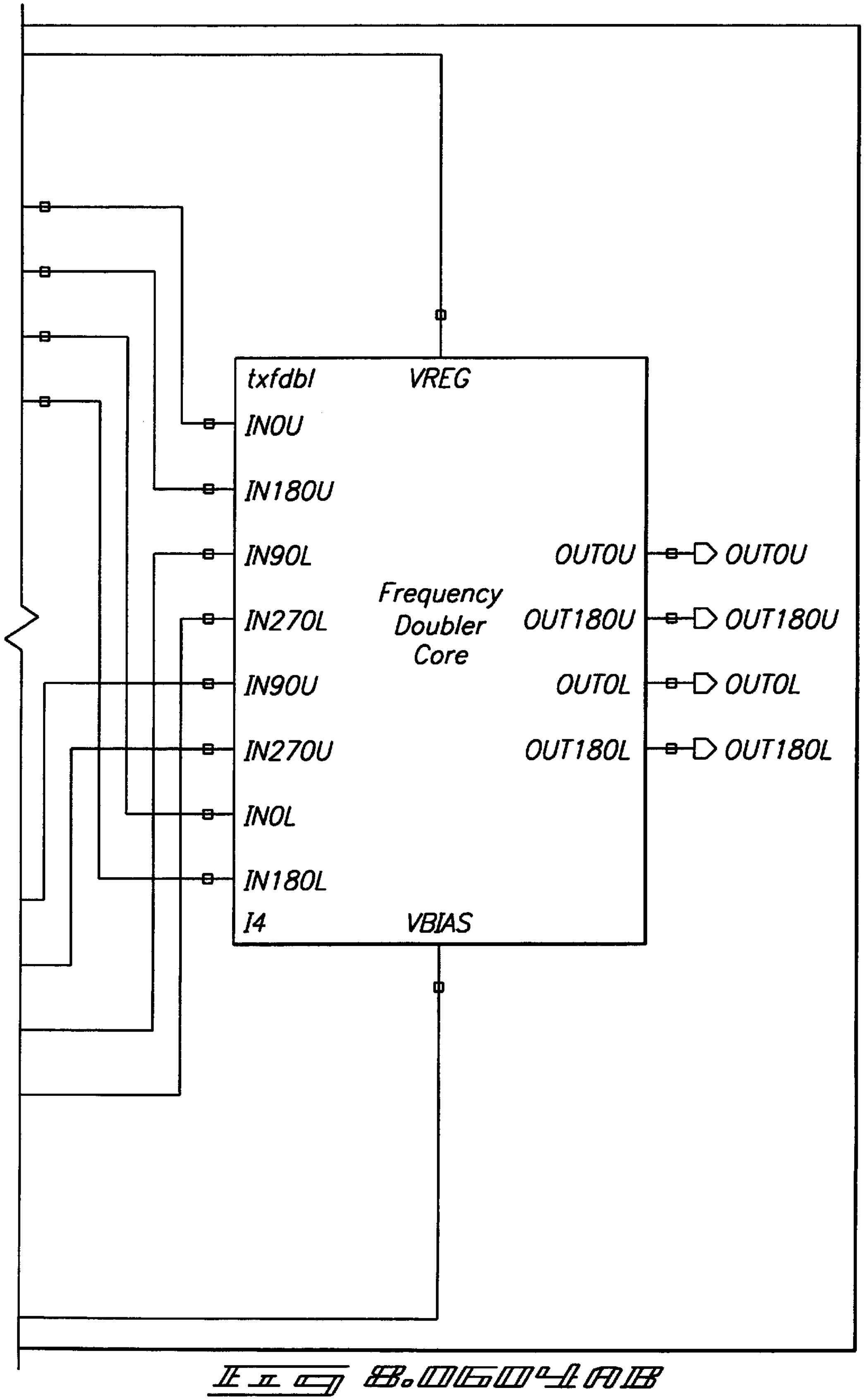
Fig 8.0604AB

| | | | | |
|---|---|---|---|---|
| 8.060401AA | 8.060401AB | 8.060401AC | 8.060401AD | 8.060401AE |
| 8.060401BA | 8.060401BB | 8.060401BC | 8.060401BD | 8.060401BE |
| 8.060401CA | 8.060401CB | 8.060401CC | 8.060401CD | 8.060401CE |
| 8.060401DA | 8.060401DB | 8.060401DC | 8.060401DD | 8.060401DE |
| 8.060401EA | 8.060401EB | 8.060401EC | 8.060401ED | 8.060401EE |
| 8.060401FA | 8.060401FB | 8.060401FC | 8.060401FD | 8.060401FE |

Fig 8.060401

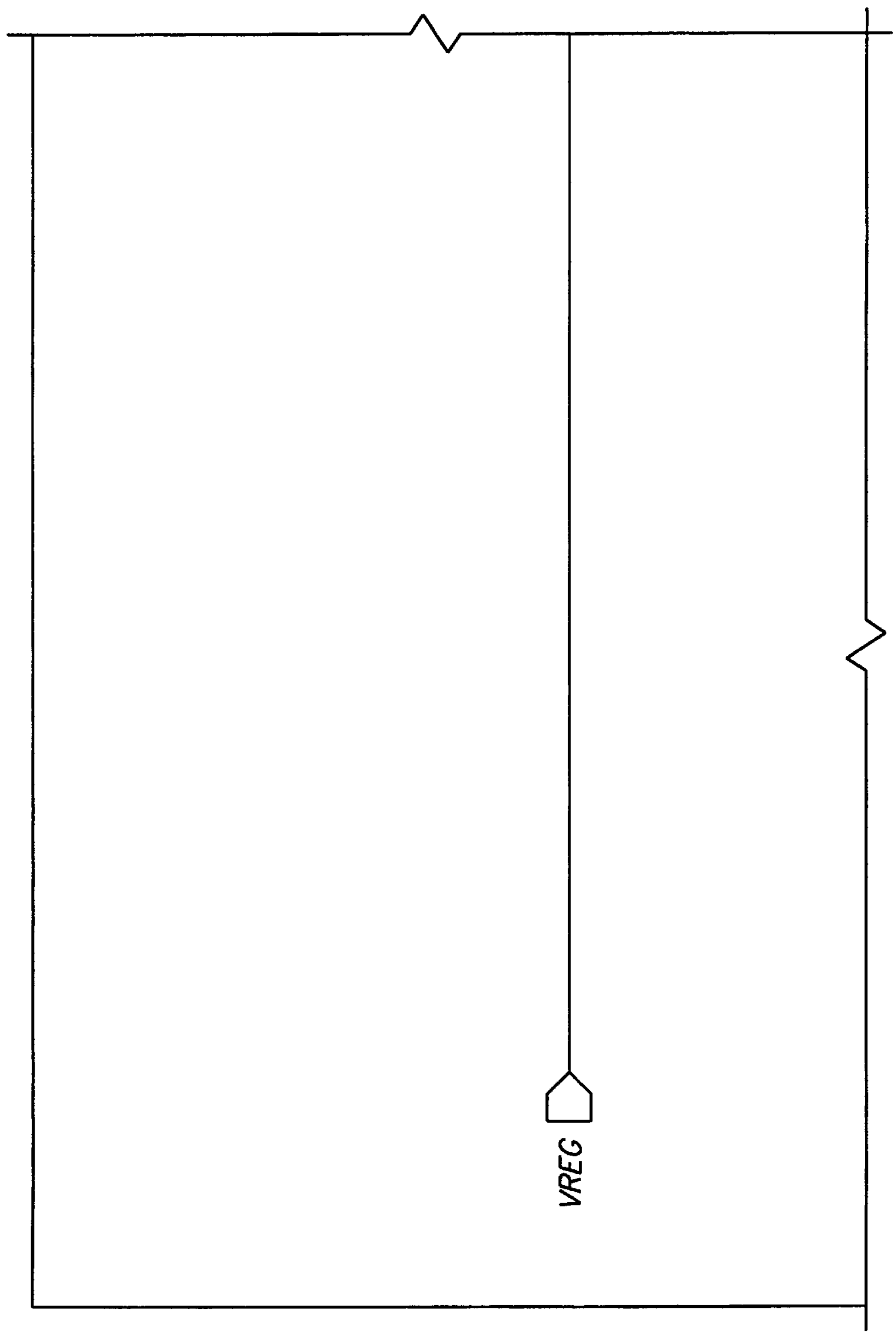
FIG. 8.060401AA

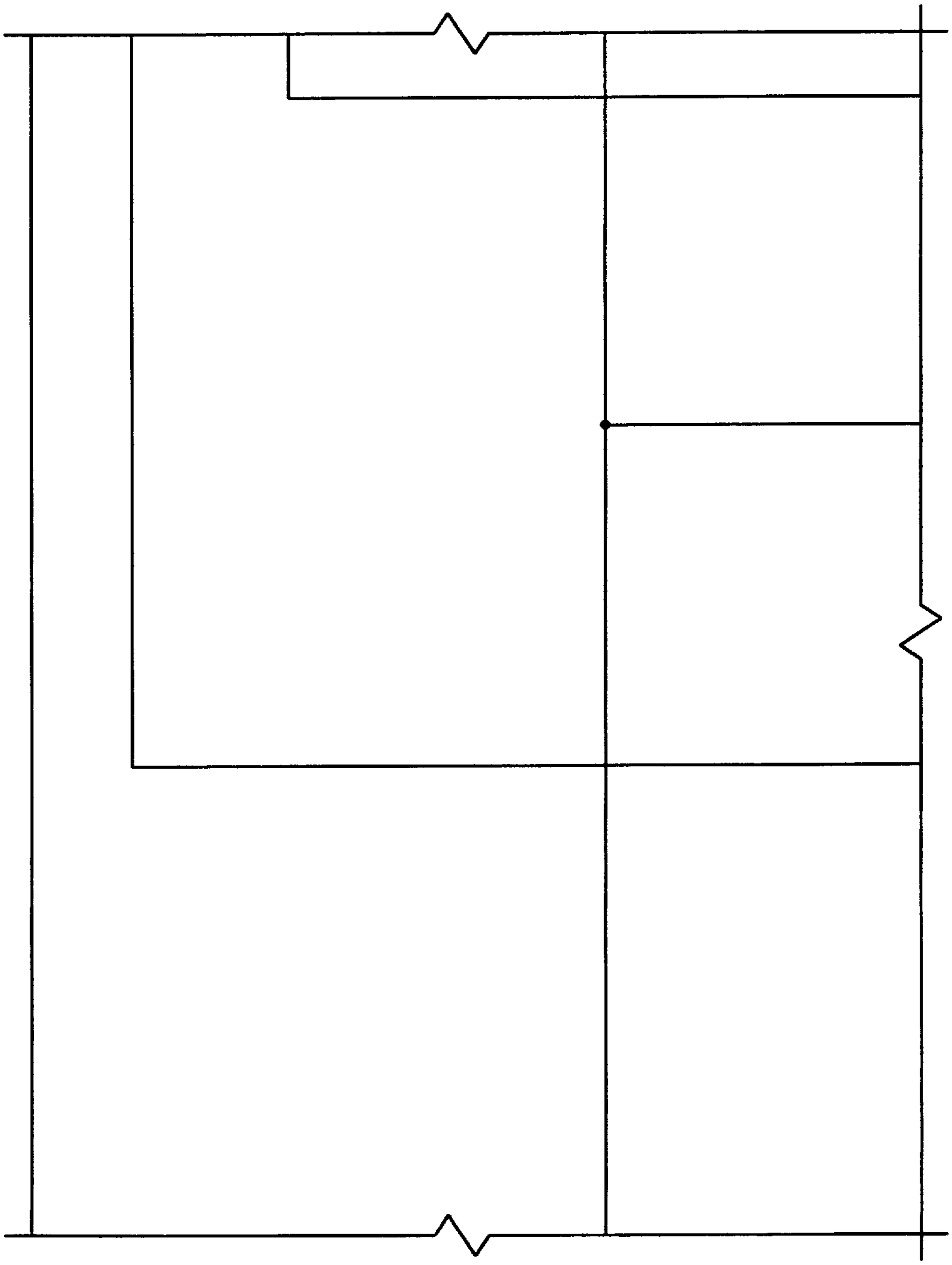
Fig 8.060401AB

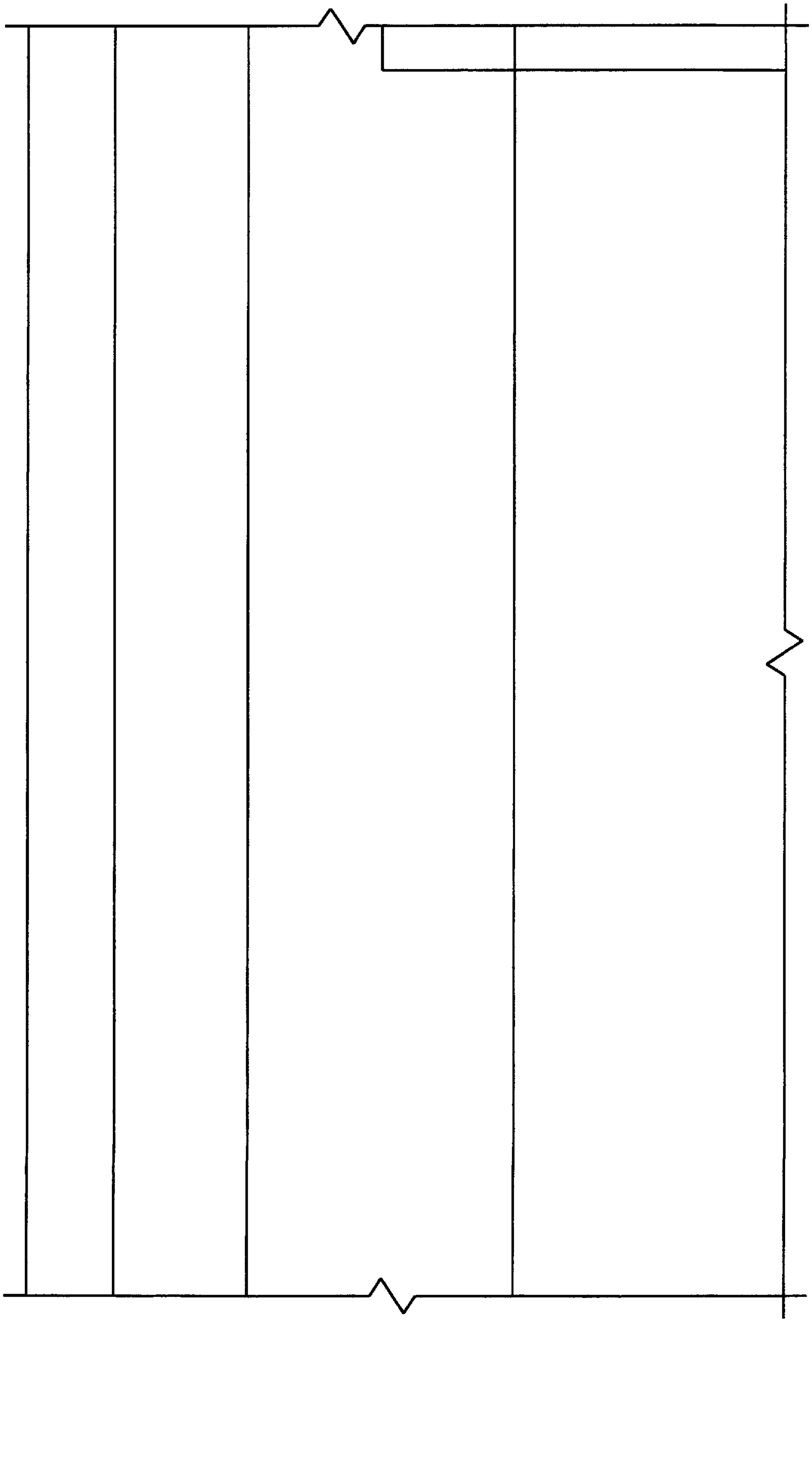
Fig 8.060401AC

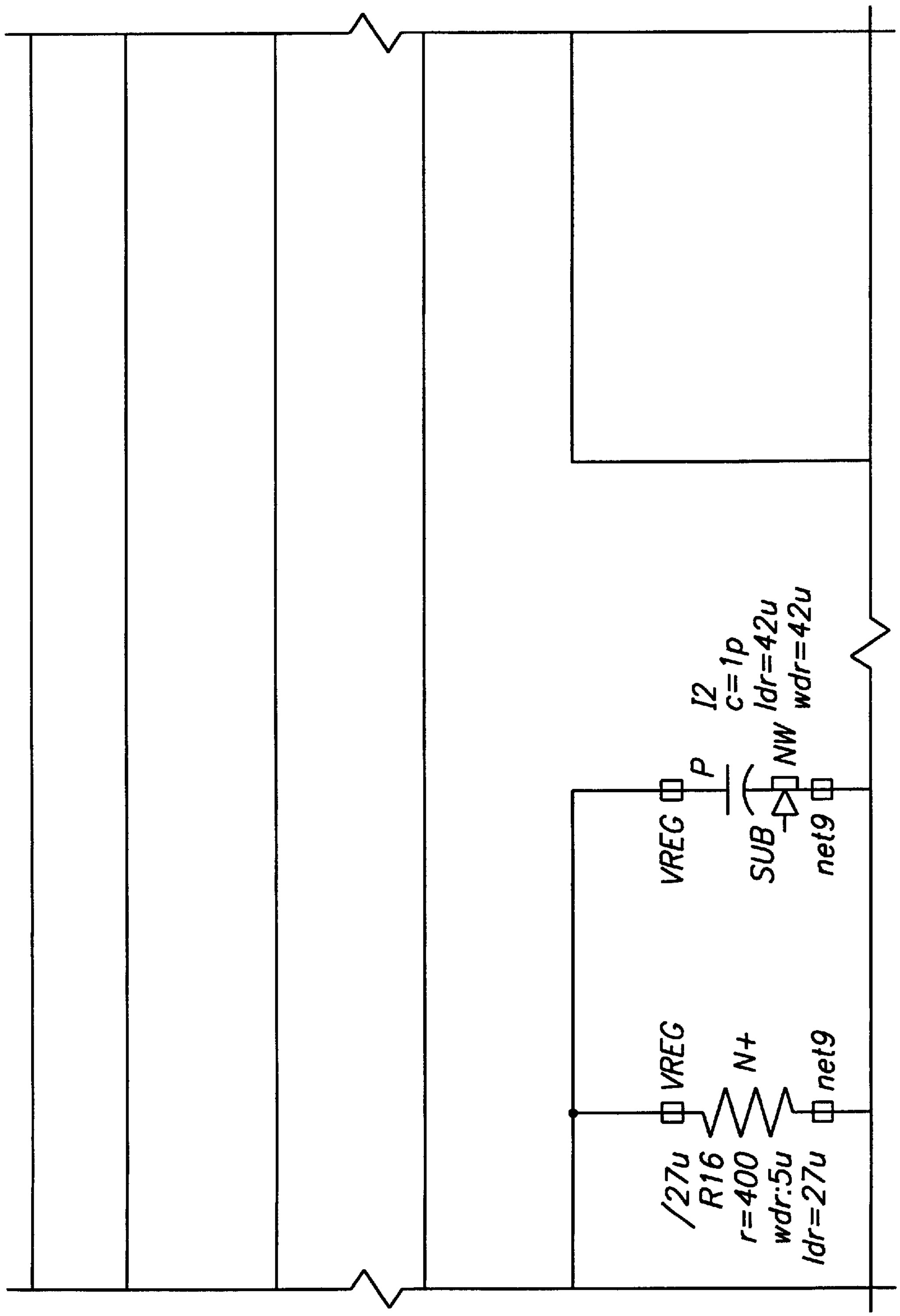
FIG. 8.0G04.I0A0

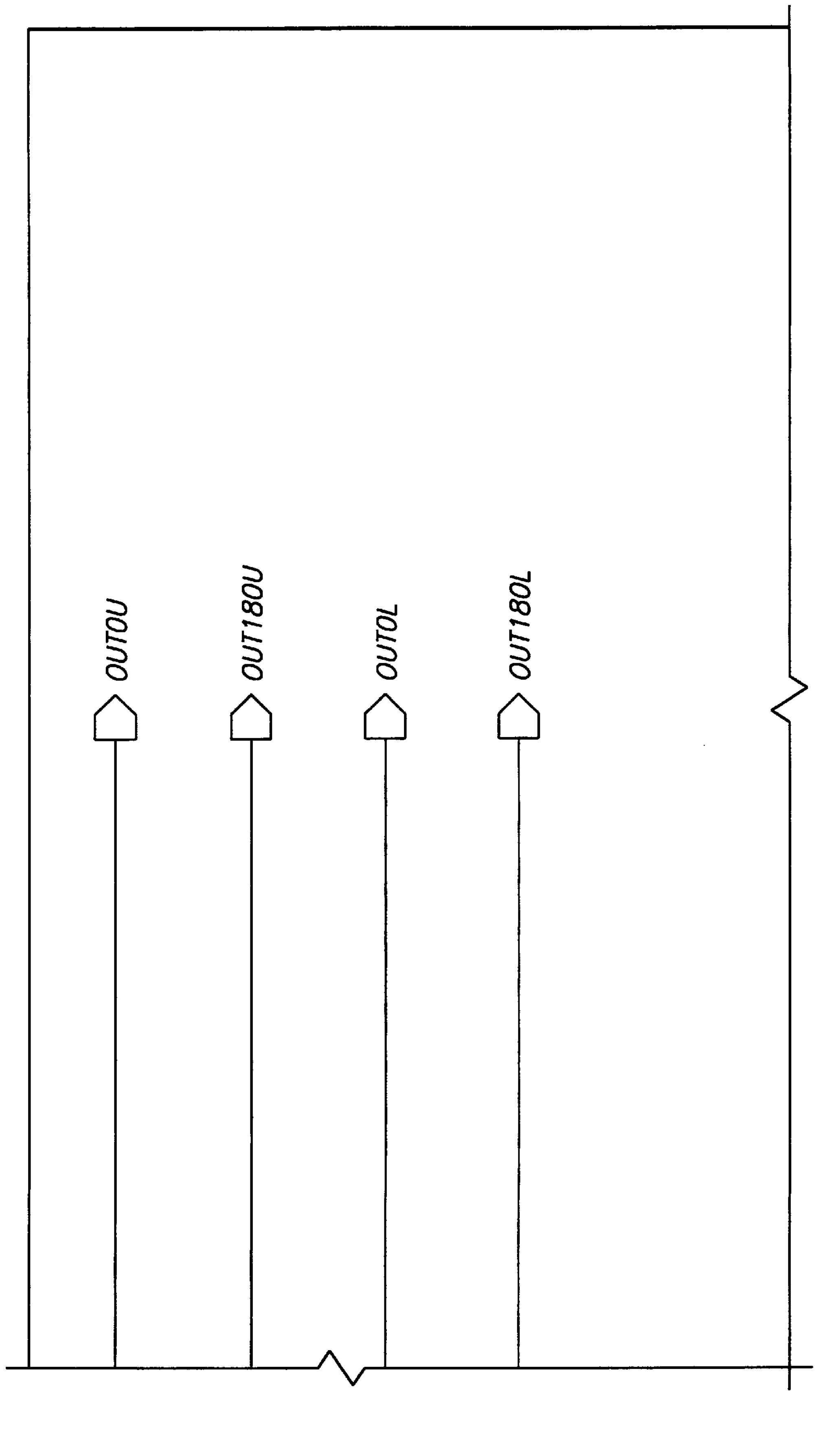
FIG. 8.060.4.01AE

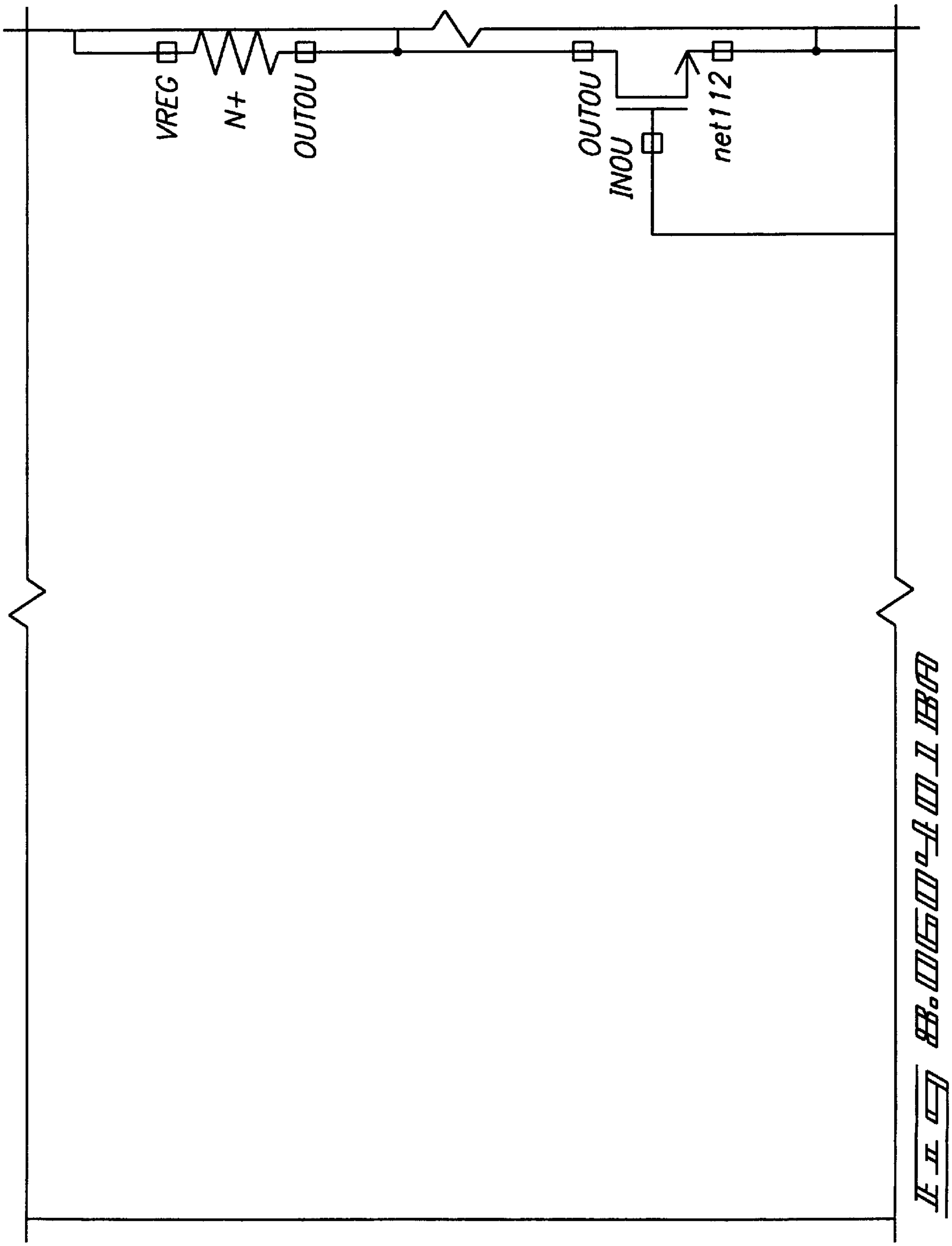
FIG. 8.060401BA

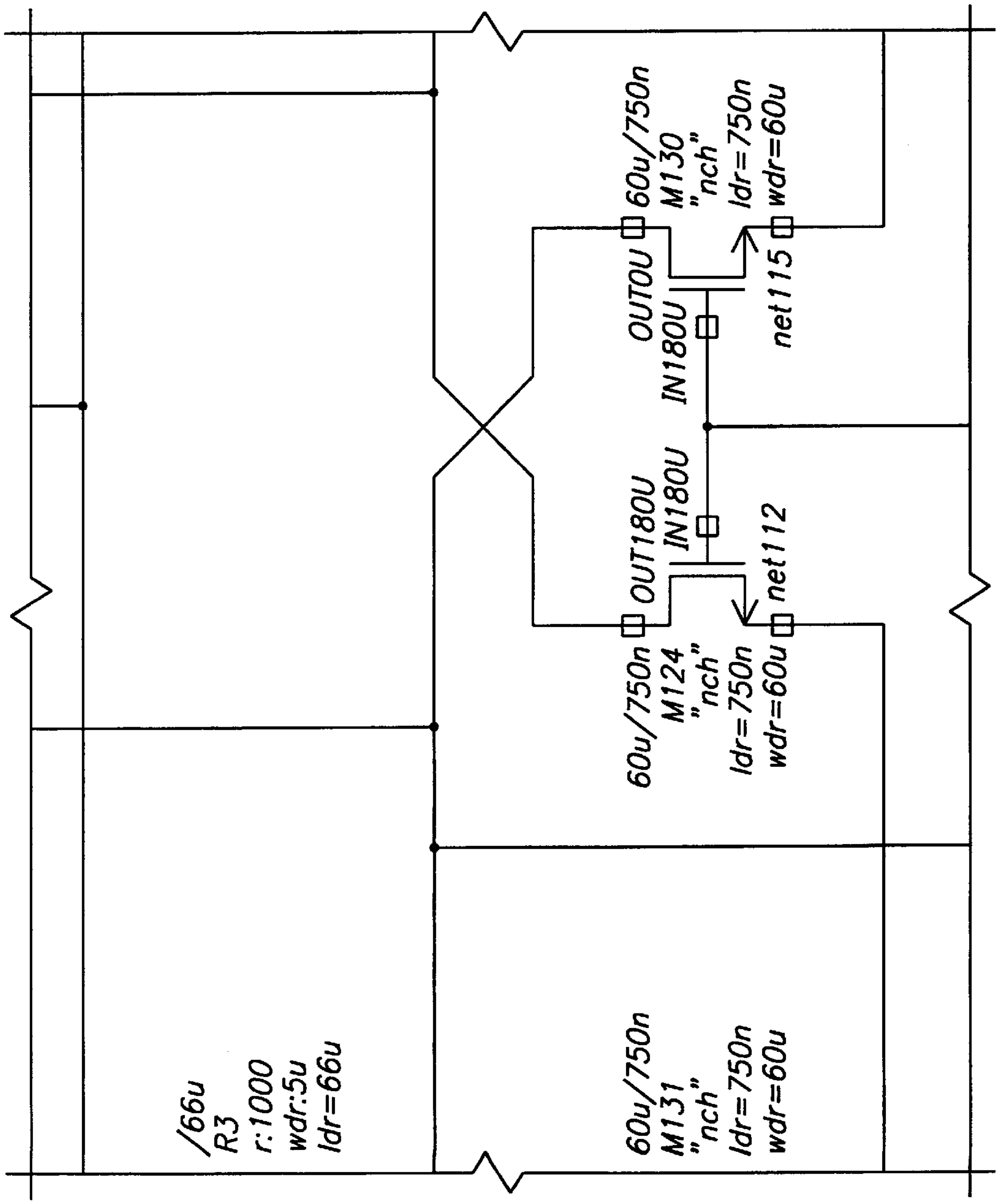
FIG. 8.06041B

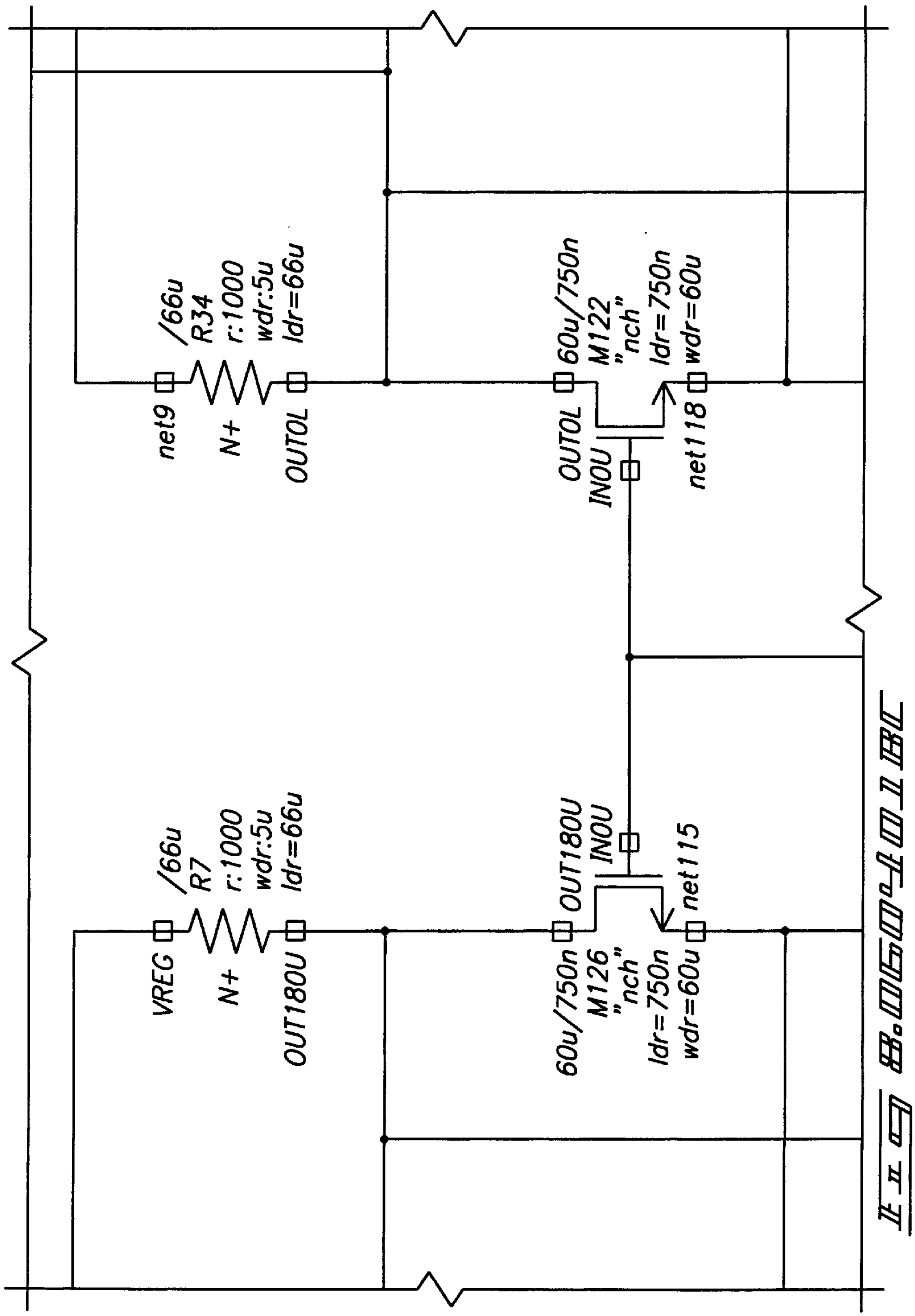
FIG. 8.060401BC

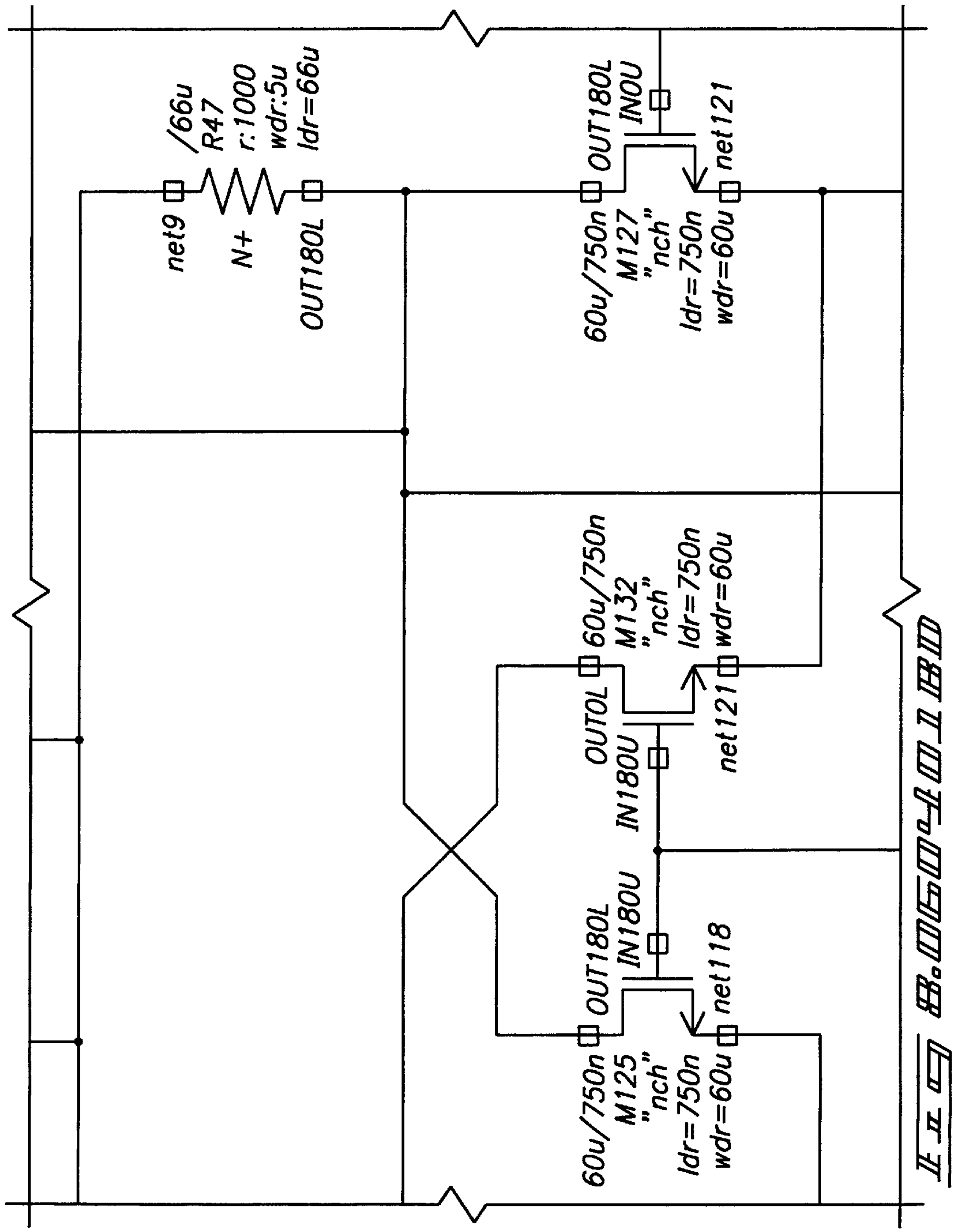
FIG. 8.050401BD

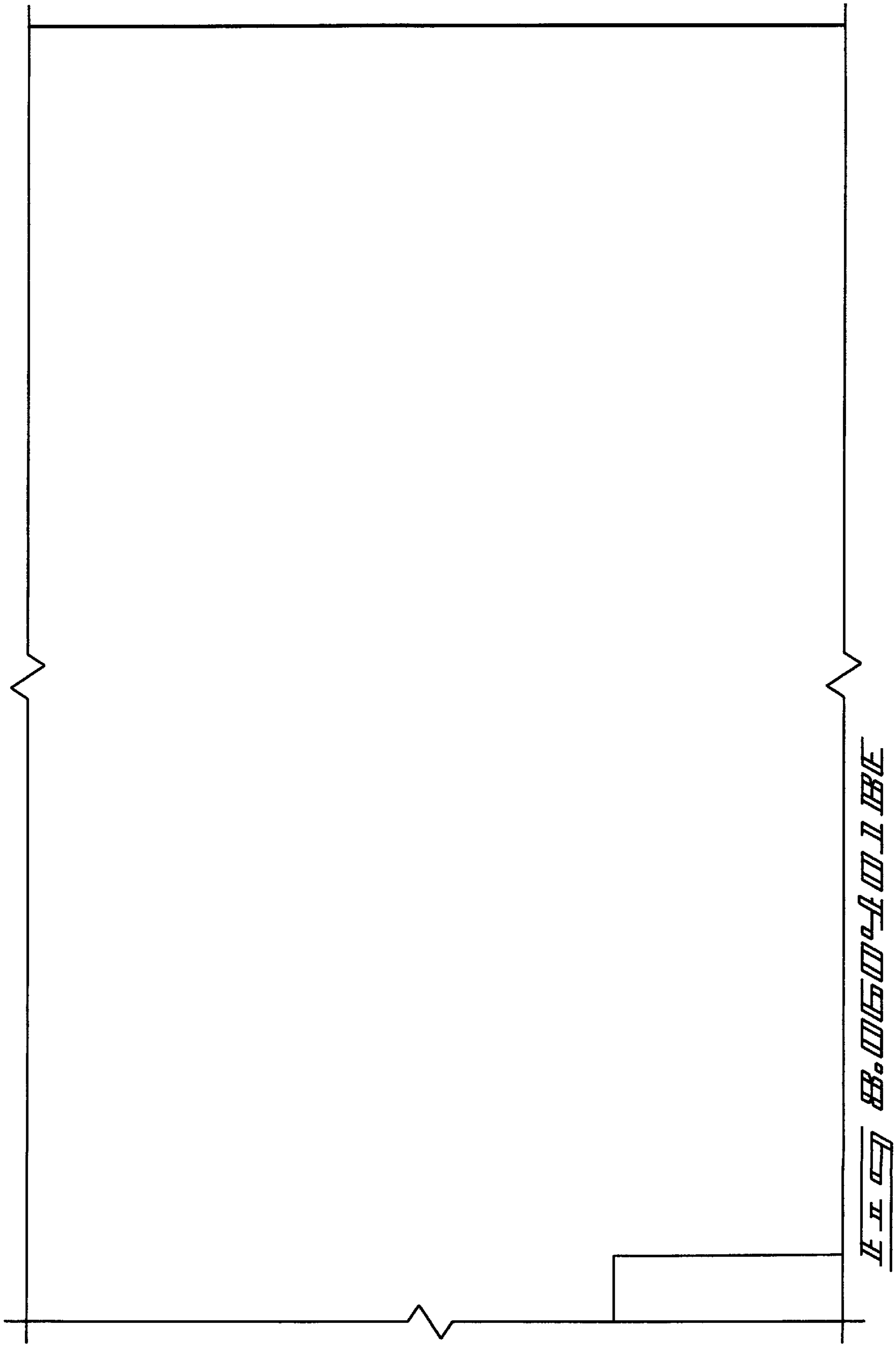
Fig. 8.060401BE

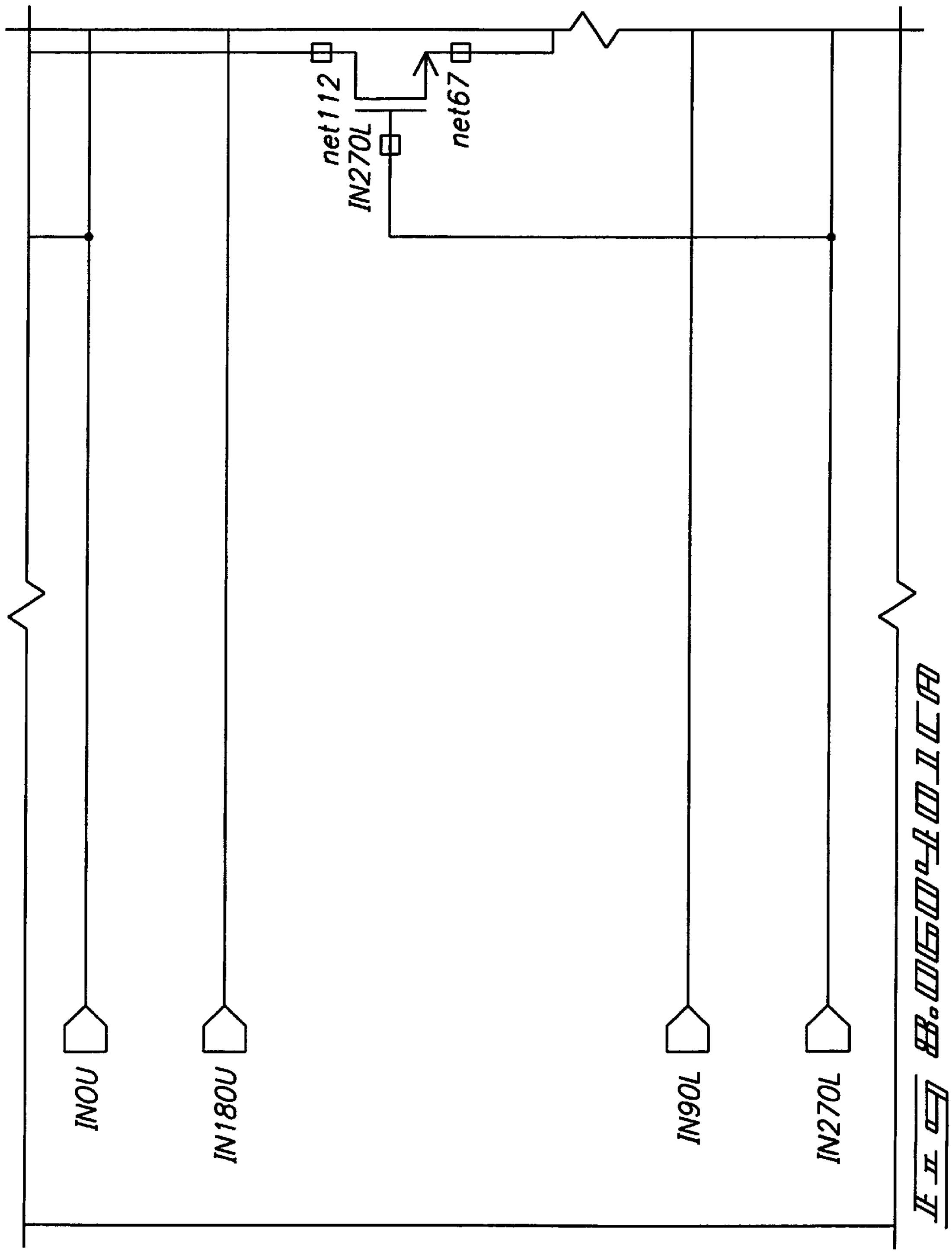
Fig. 8.0604.01CA

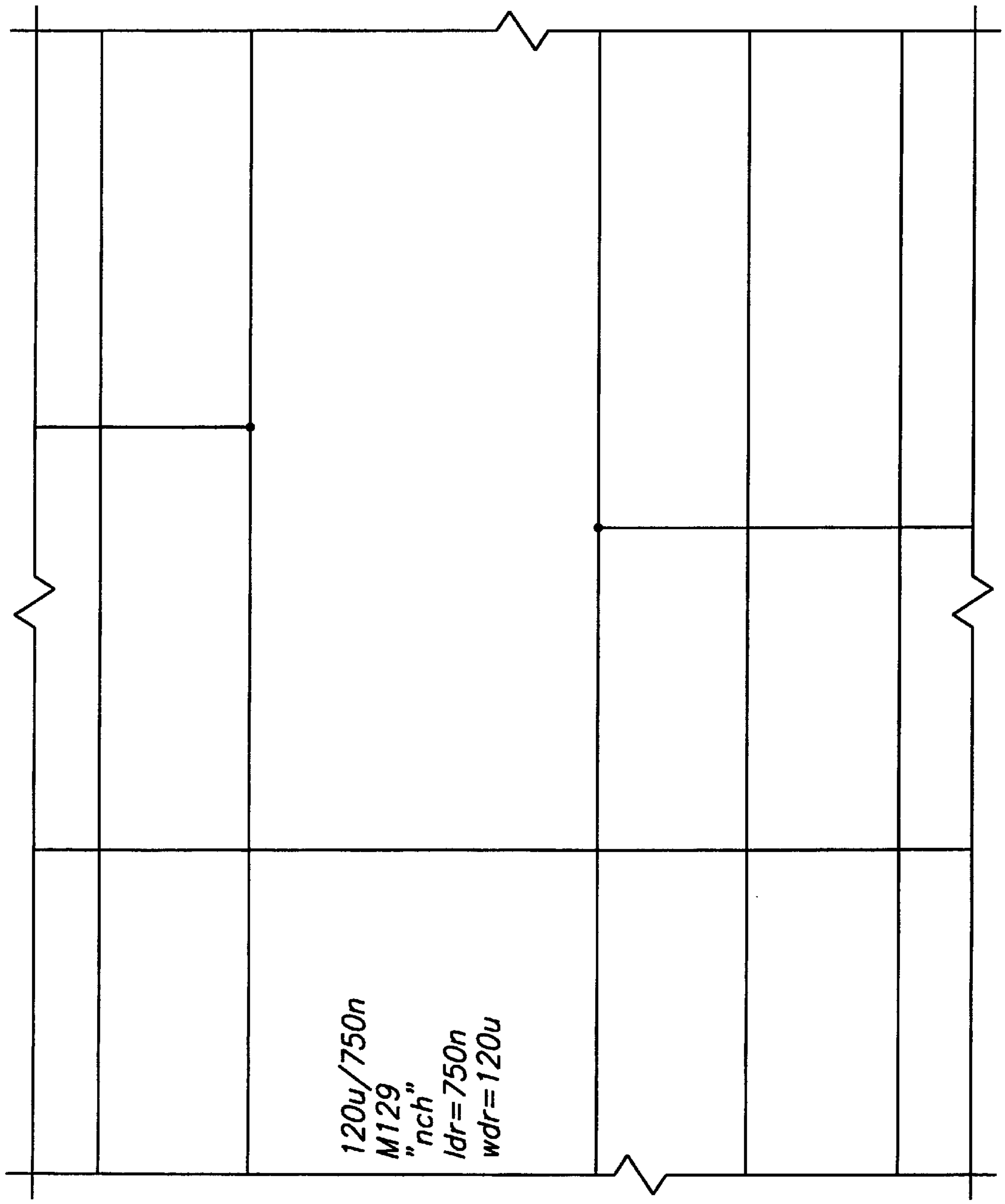
Fig. 8.060401CB

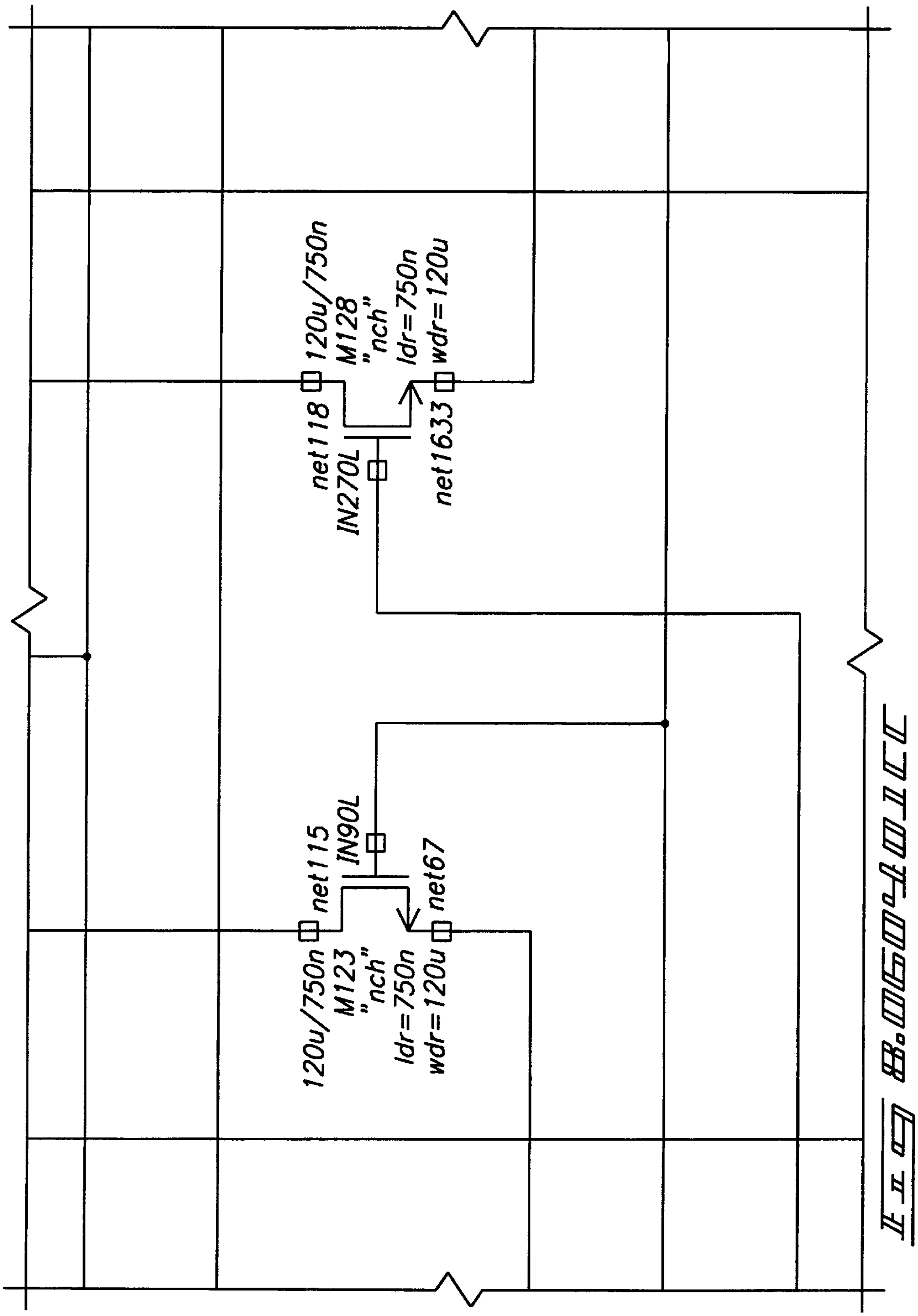
Fig. 8.060401CC

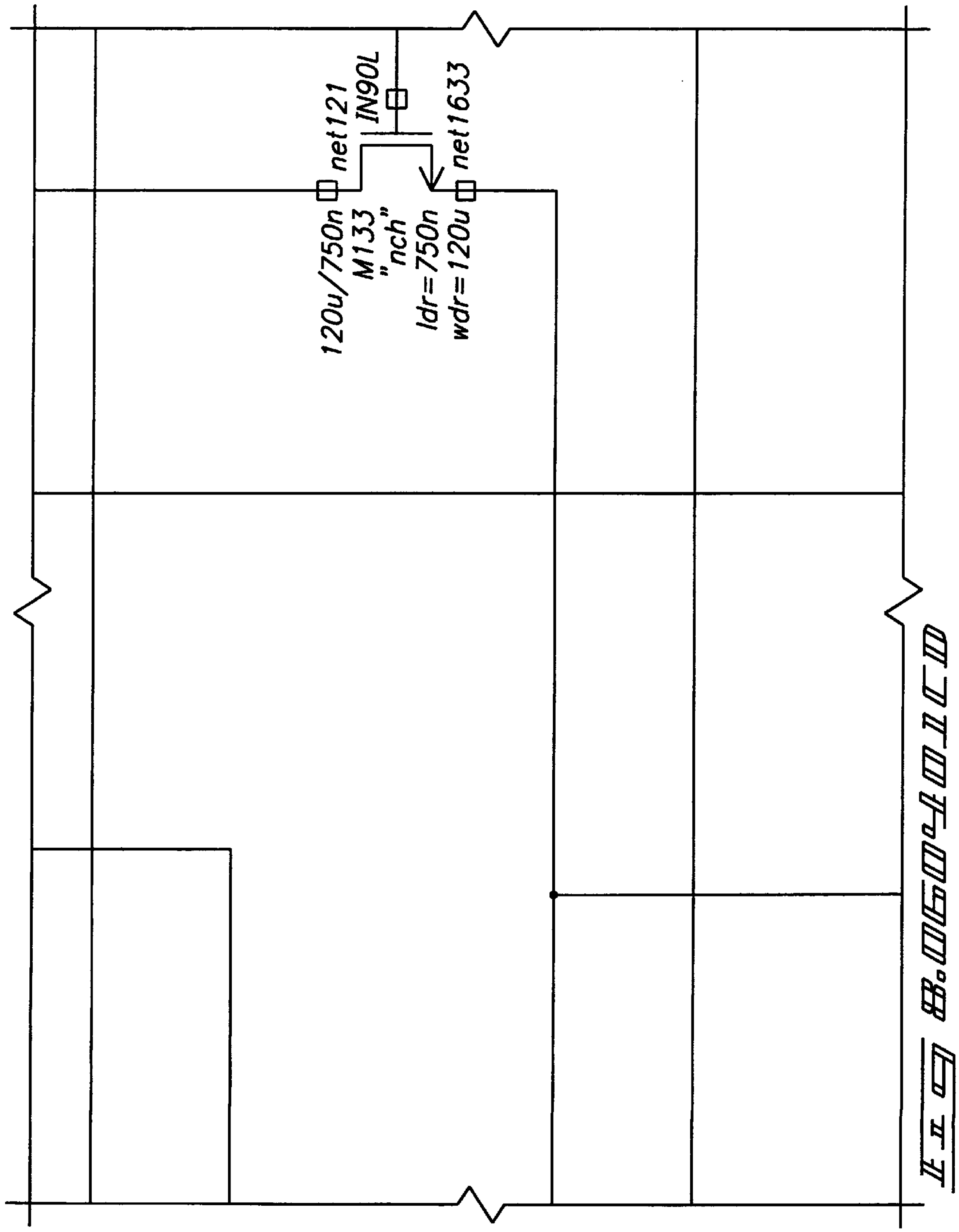
FIG. 8.060401CD

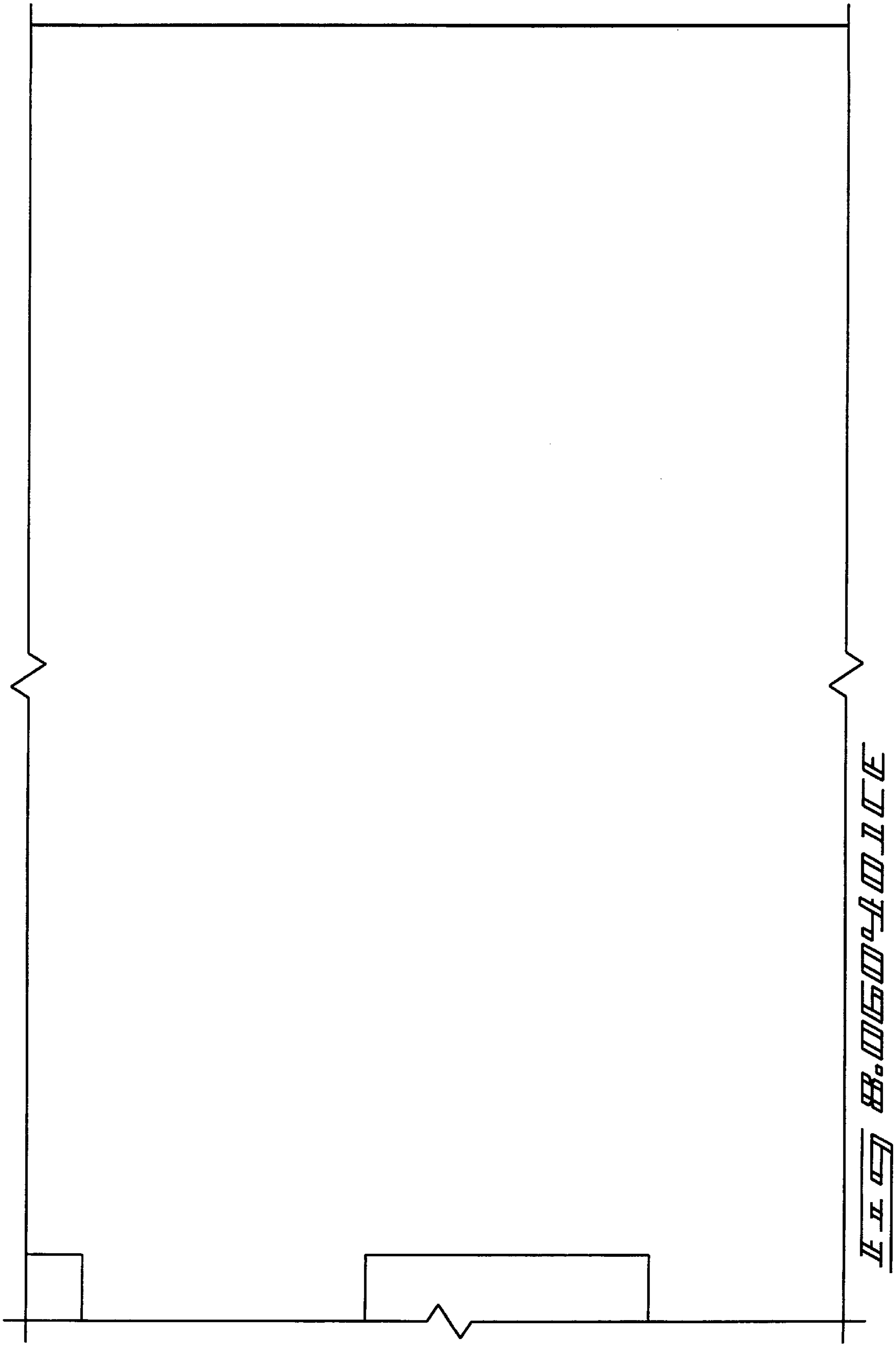
FIG 8.06040ICE

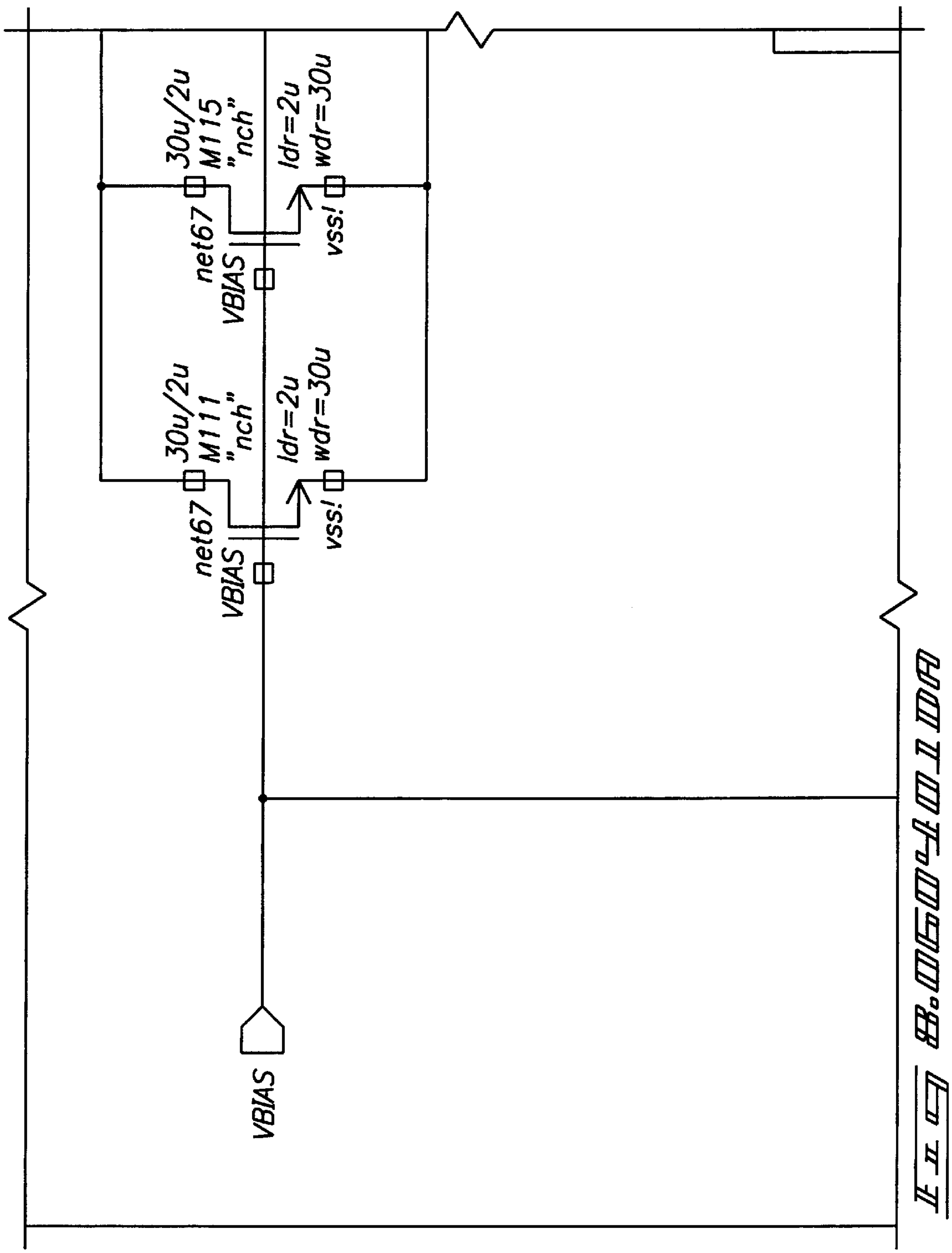
Fig. 8.050410A

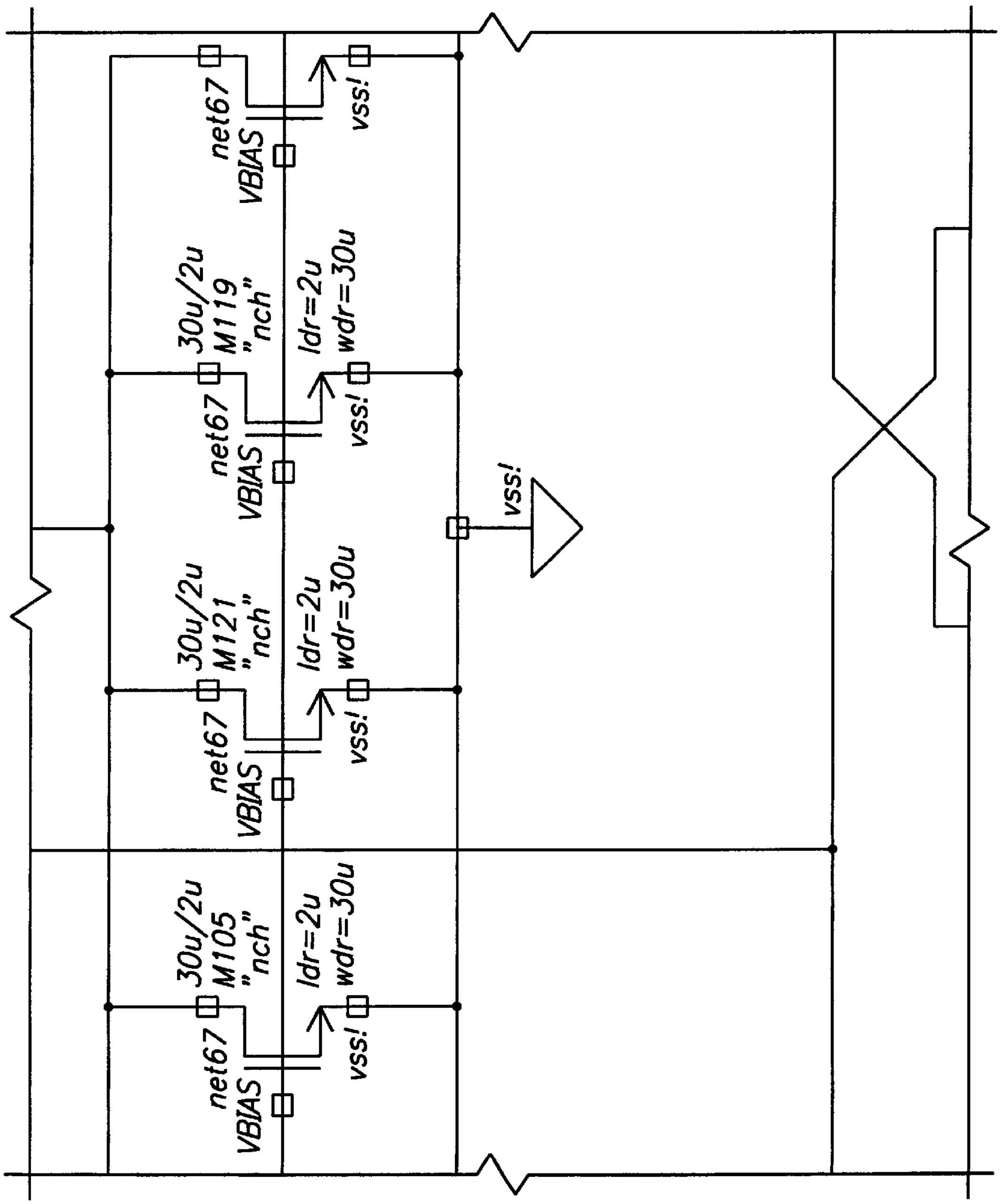
FIG. 8.0060.4010B

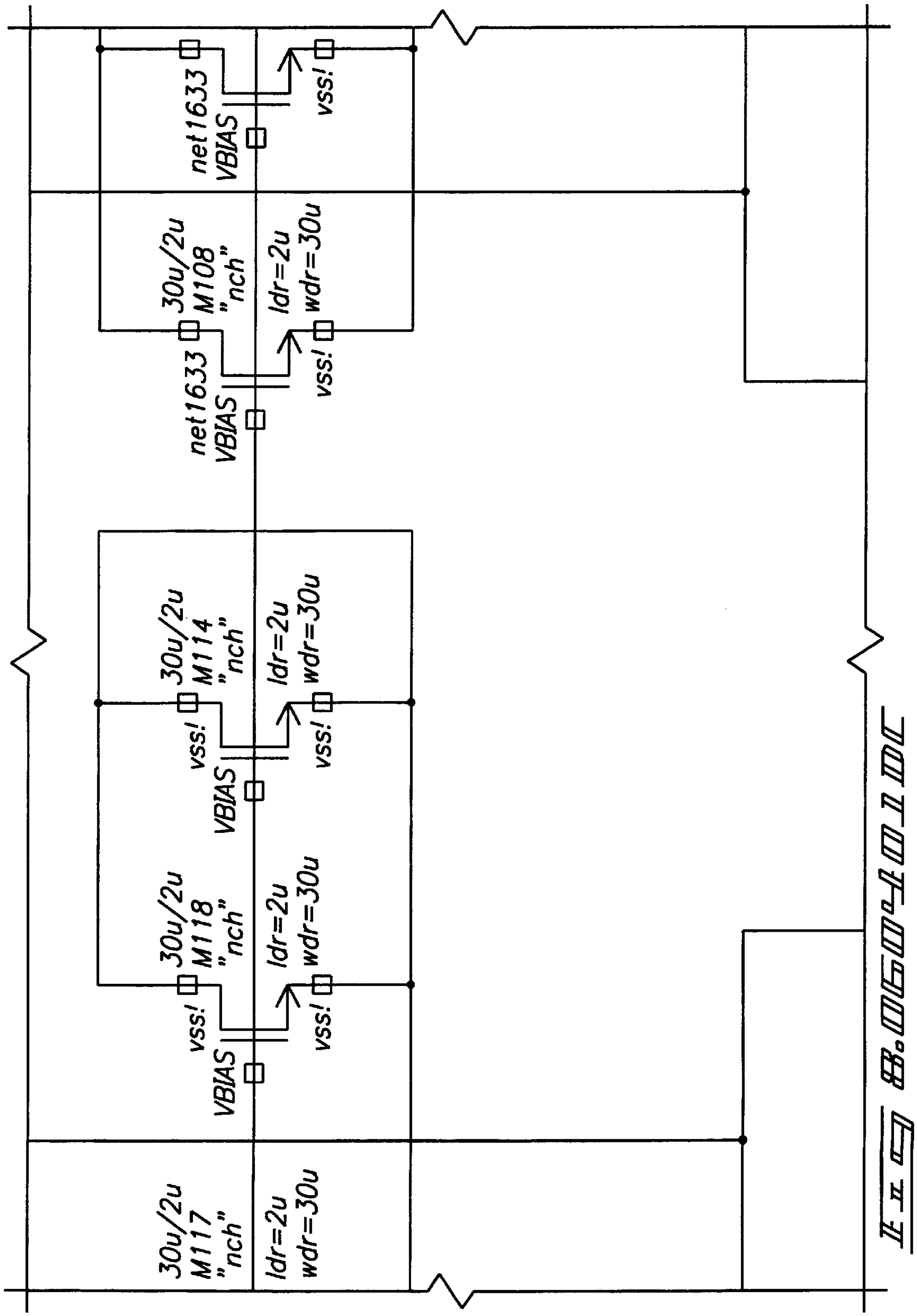
FIG. 8.060401DC

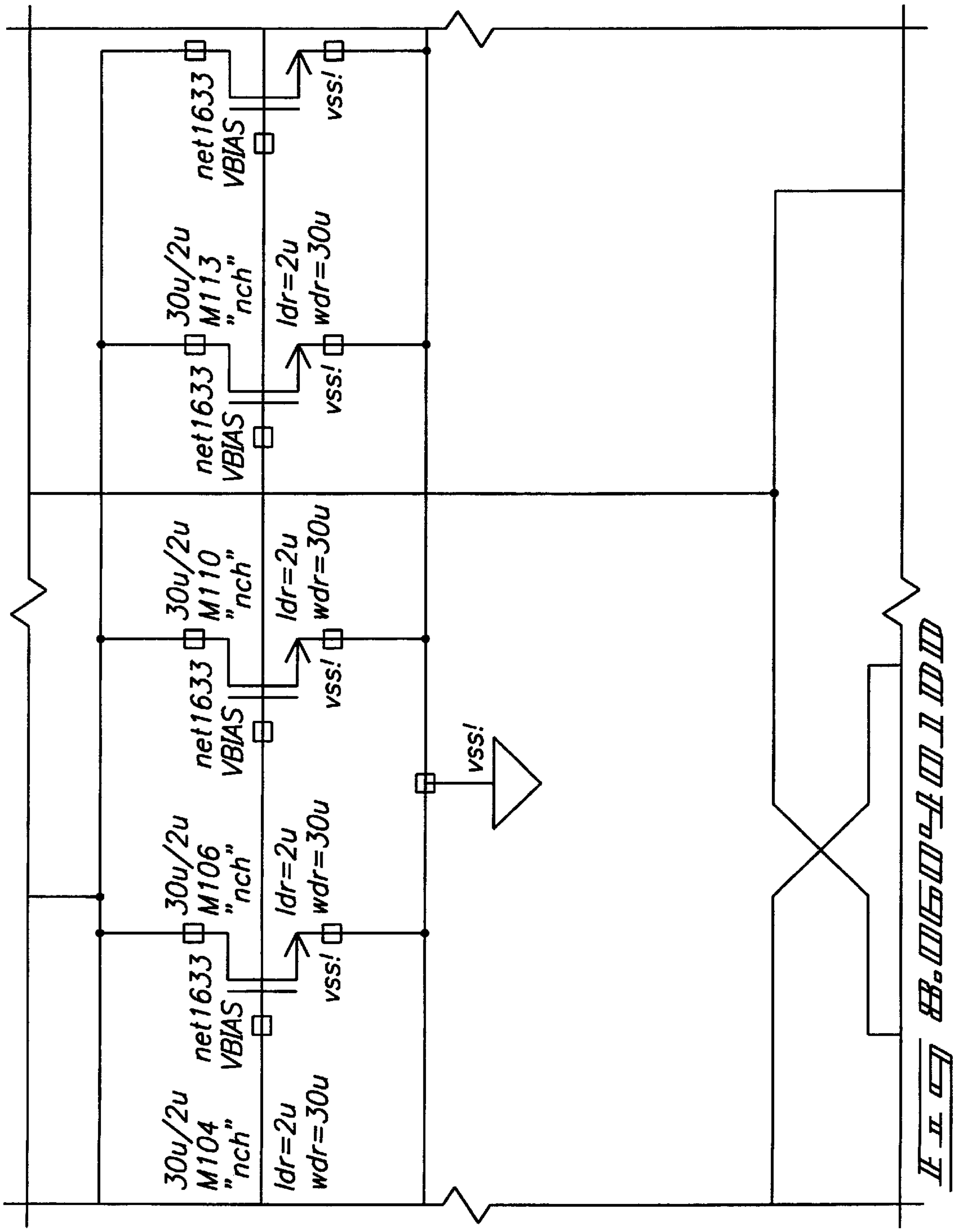
Fig. 8.060401DD

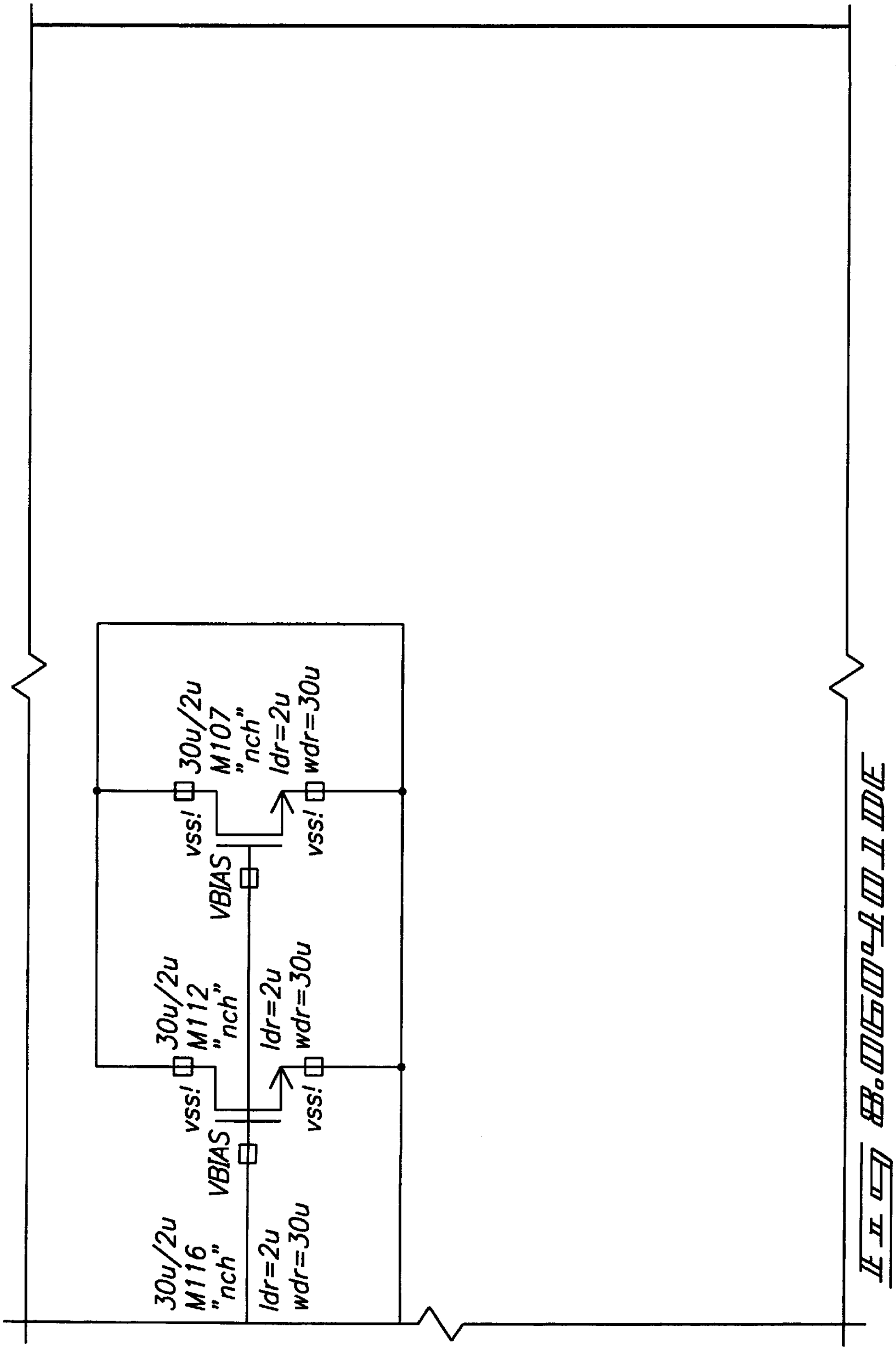
FIG. 8.060401DE

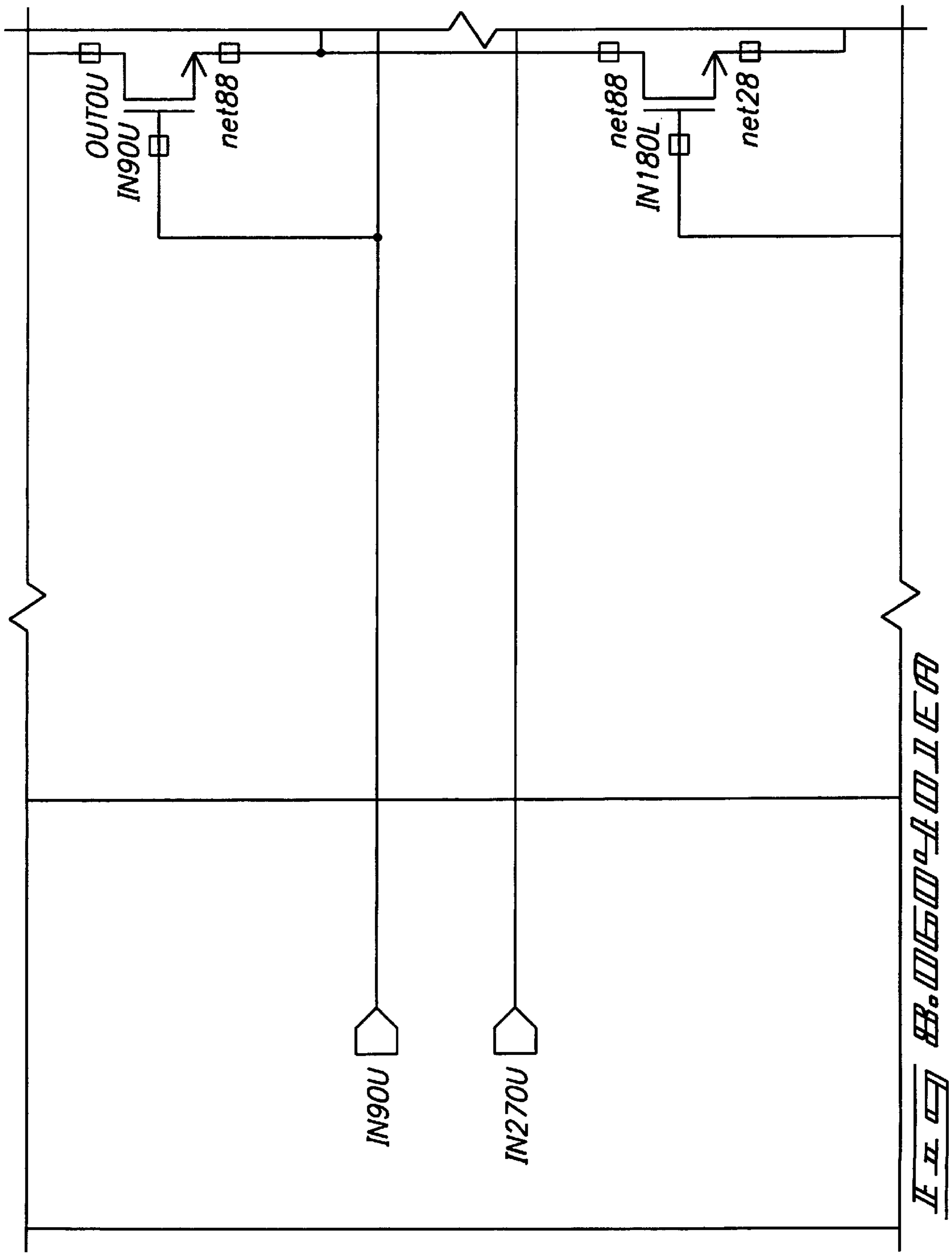
Fig. 8.0604.01EA

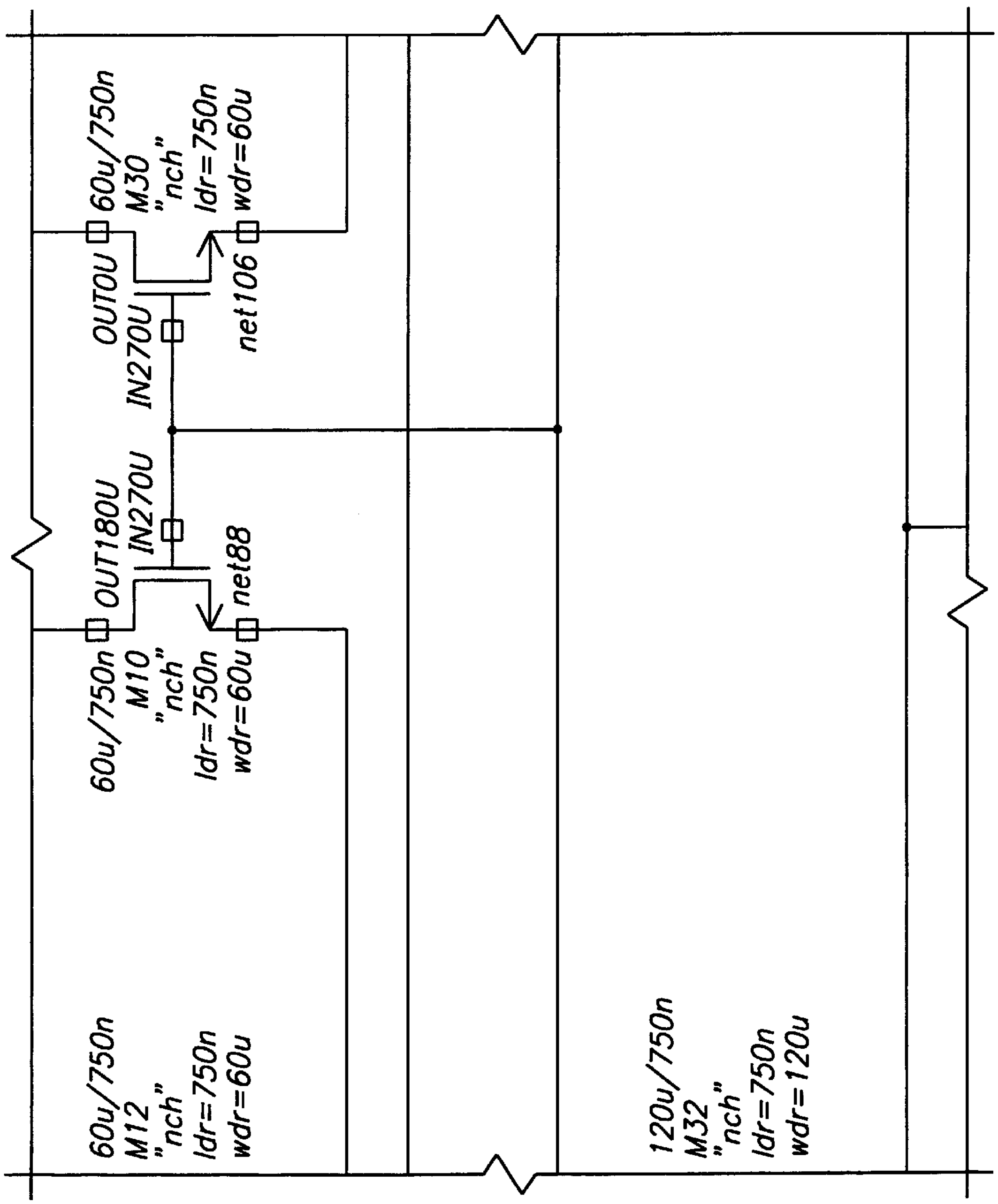
Fig 8.06040IEB

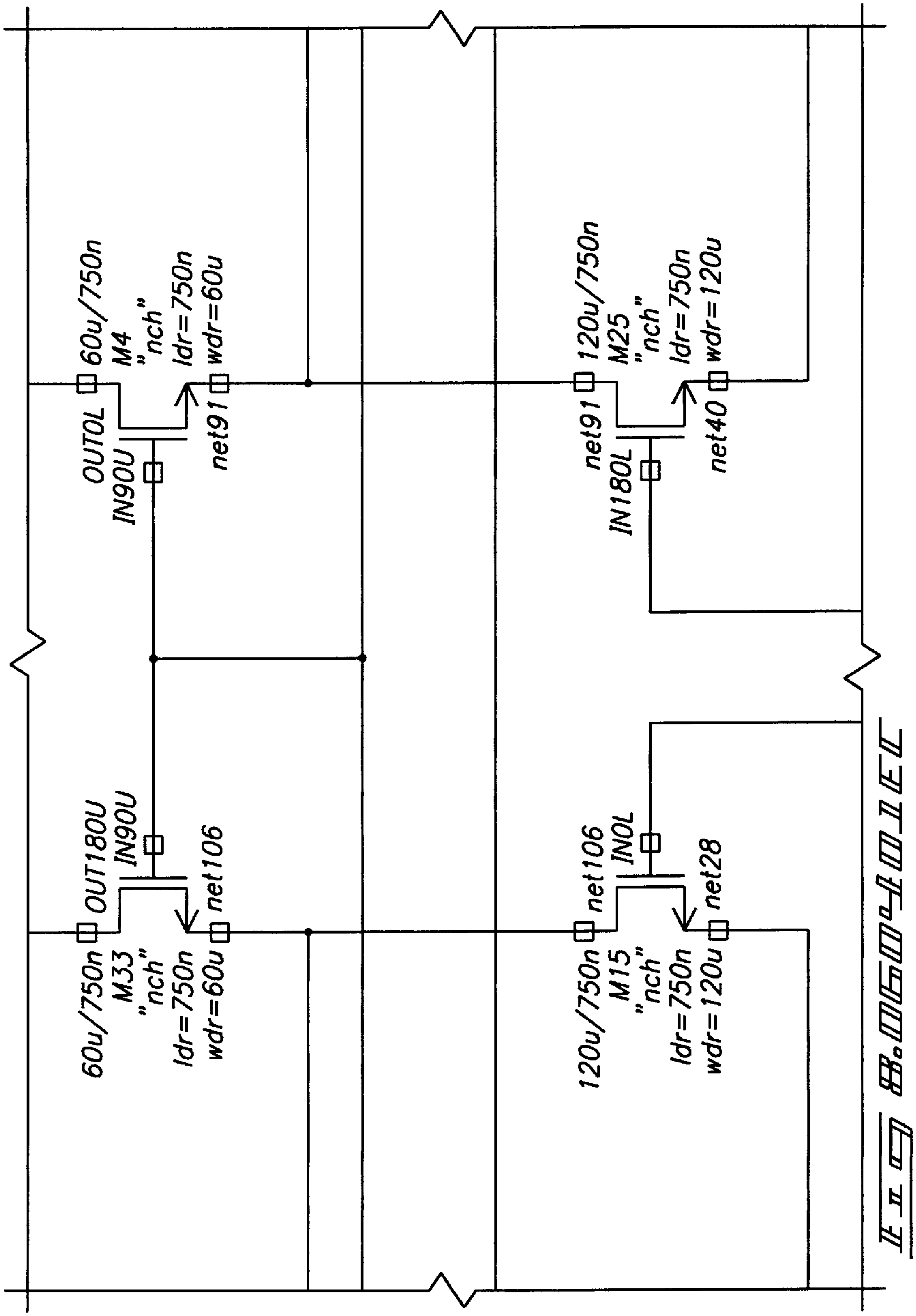
Fig. 8.060401EC

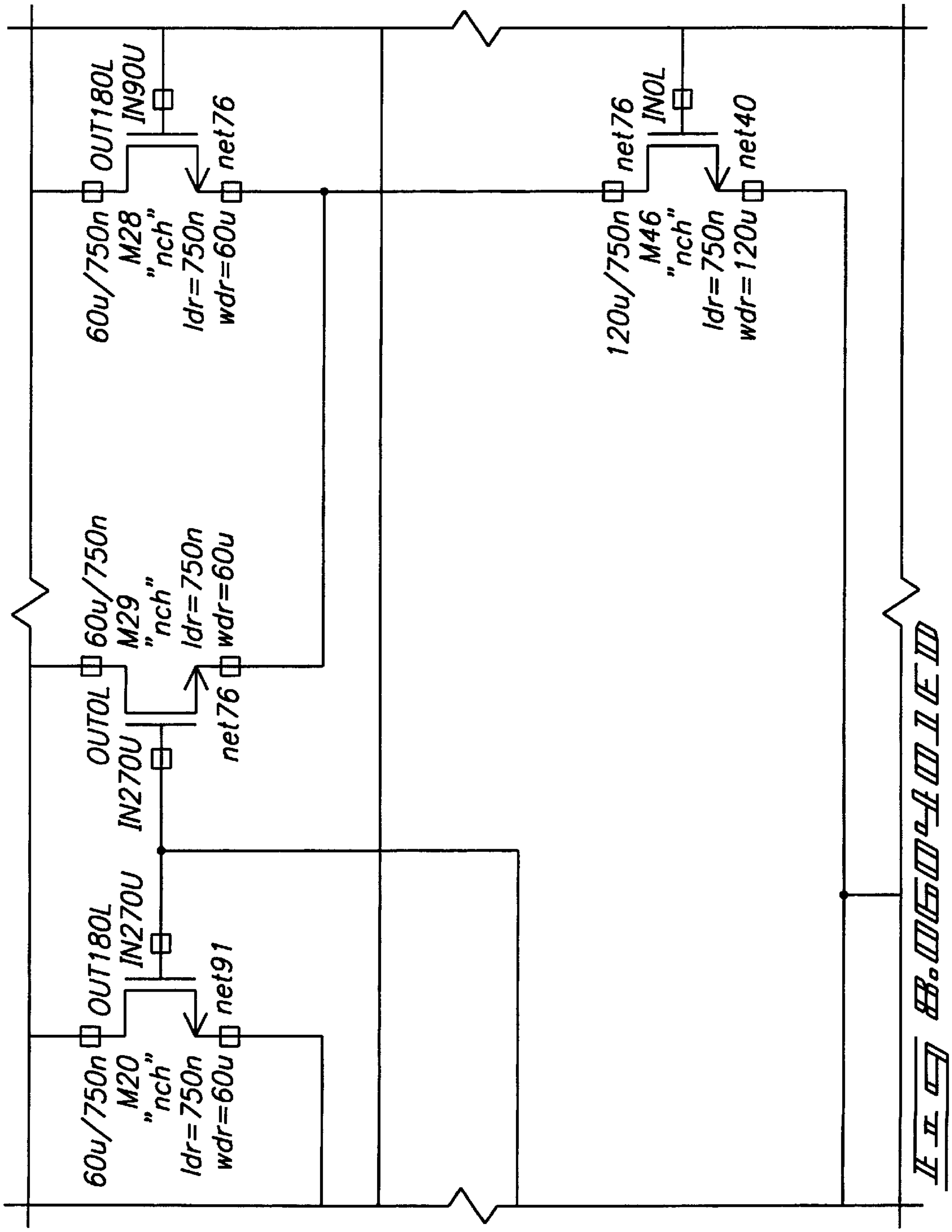
OUT180L
IN90U
net76
60u/750n
M28
"nch"
ldr=750n
wdr=60u
net76
INOL
net40
120u/750n
M46
"nch"
ldr=750n
wdr=120u
60u/750n
M29
"nch"
ldr=750n
wdr=60u
OUTOL
IN270U
net76
OUT180L
IN270U
net91
60u/750n
M20
"nch"
ldr=750n
wdr=60u

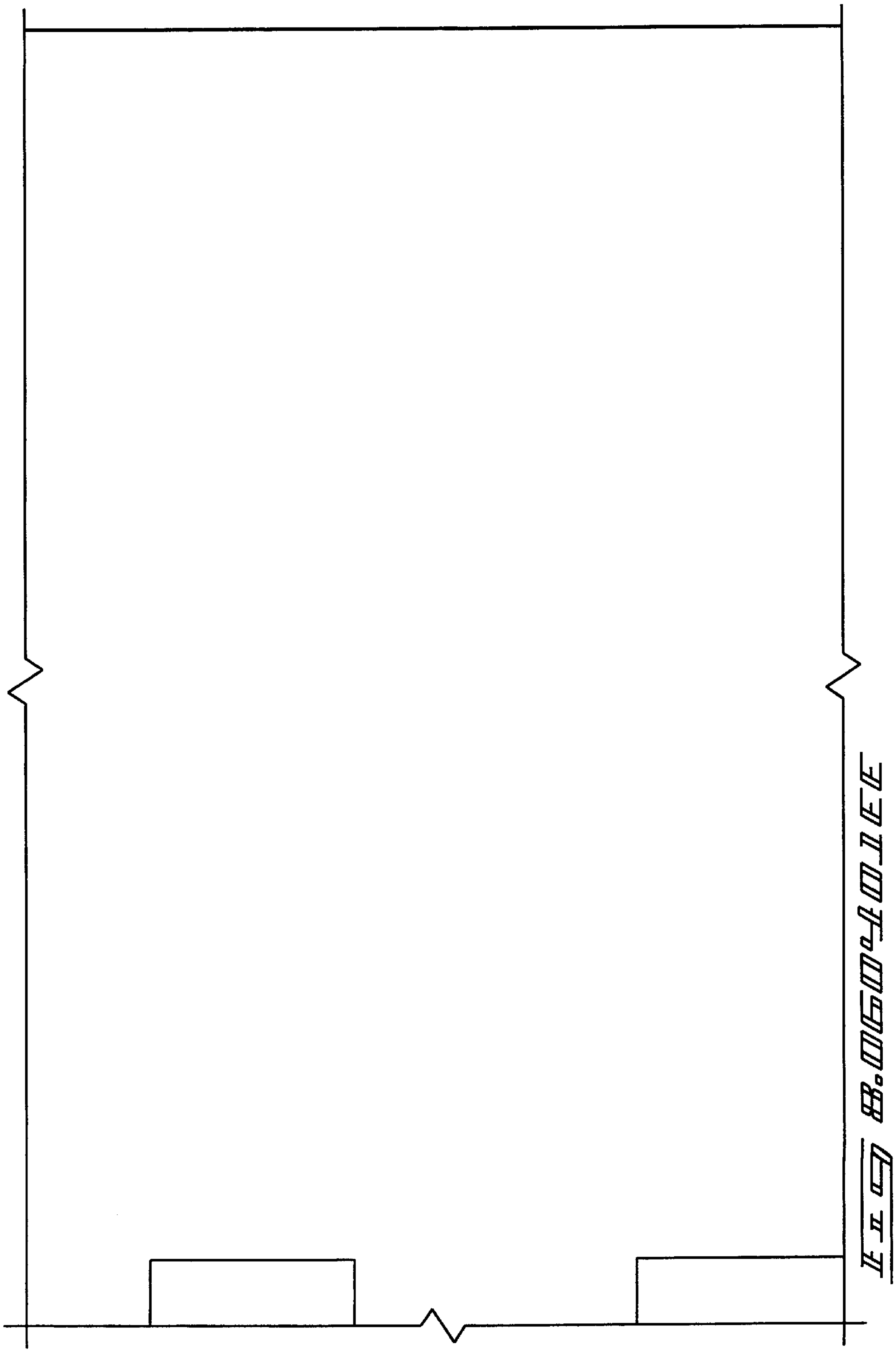
FIG. 8.060401EE

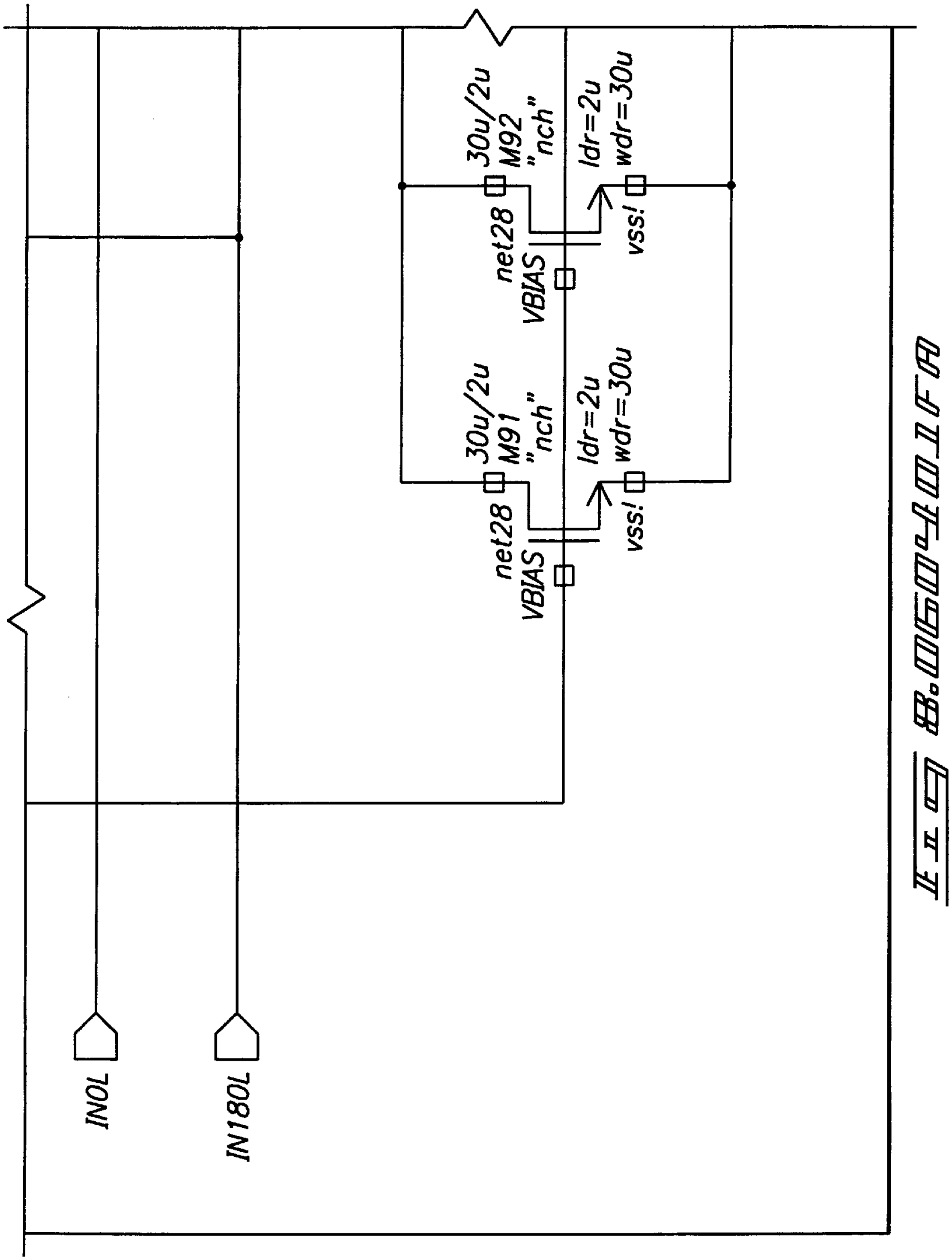
FIG. 8.0604.01FA

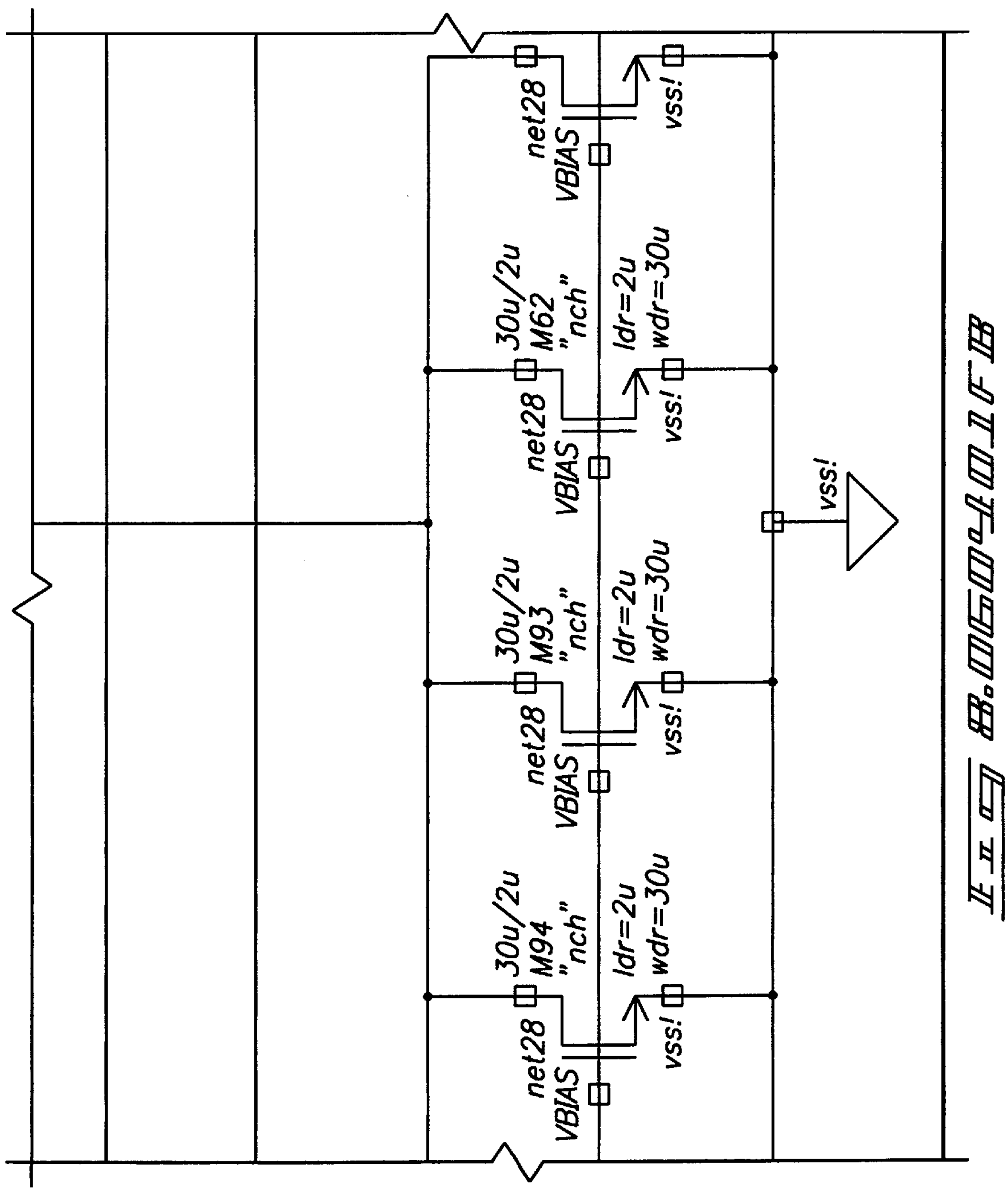
Fig. 8.060401FB

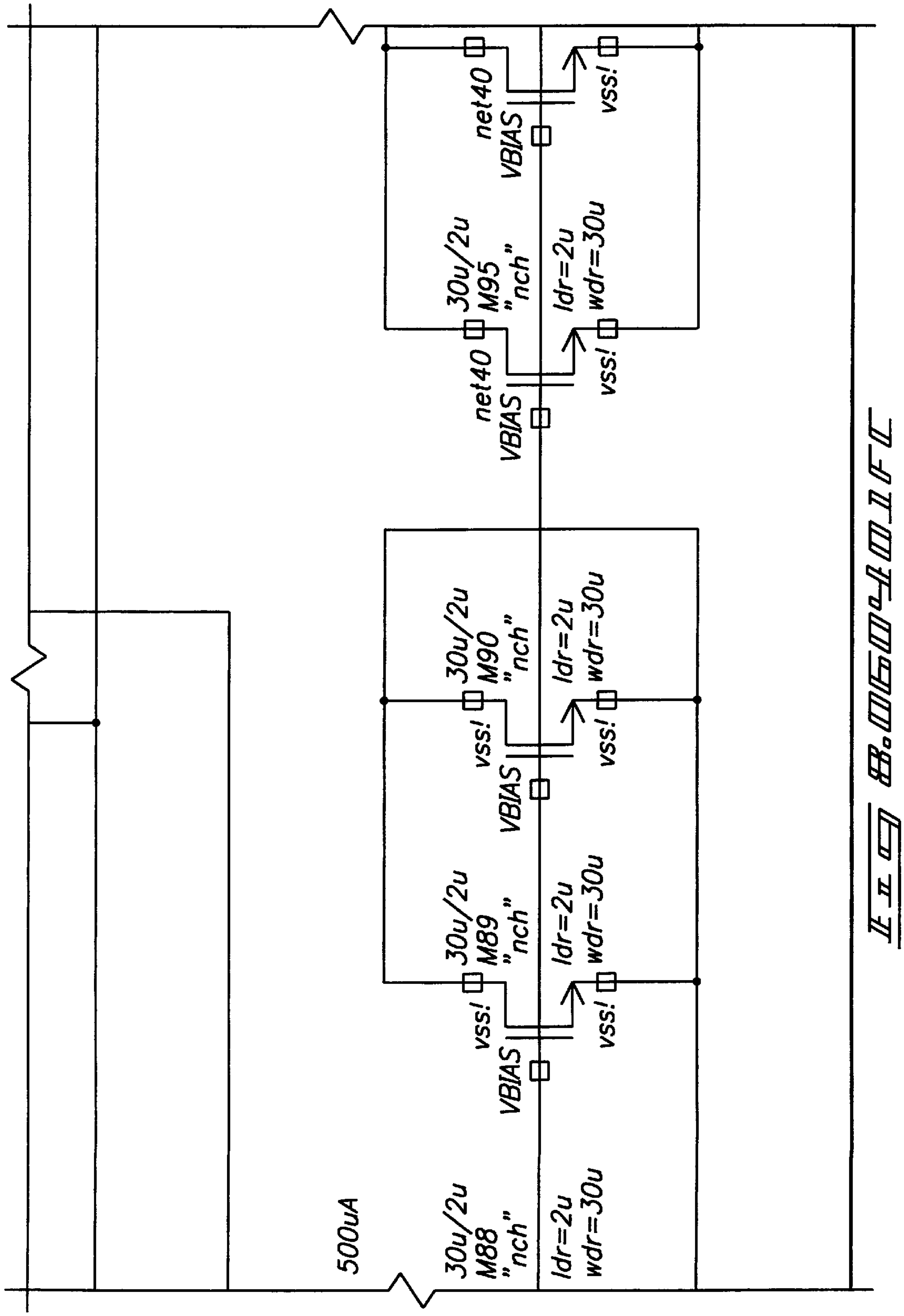
FIG. 8.060401C

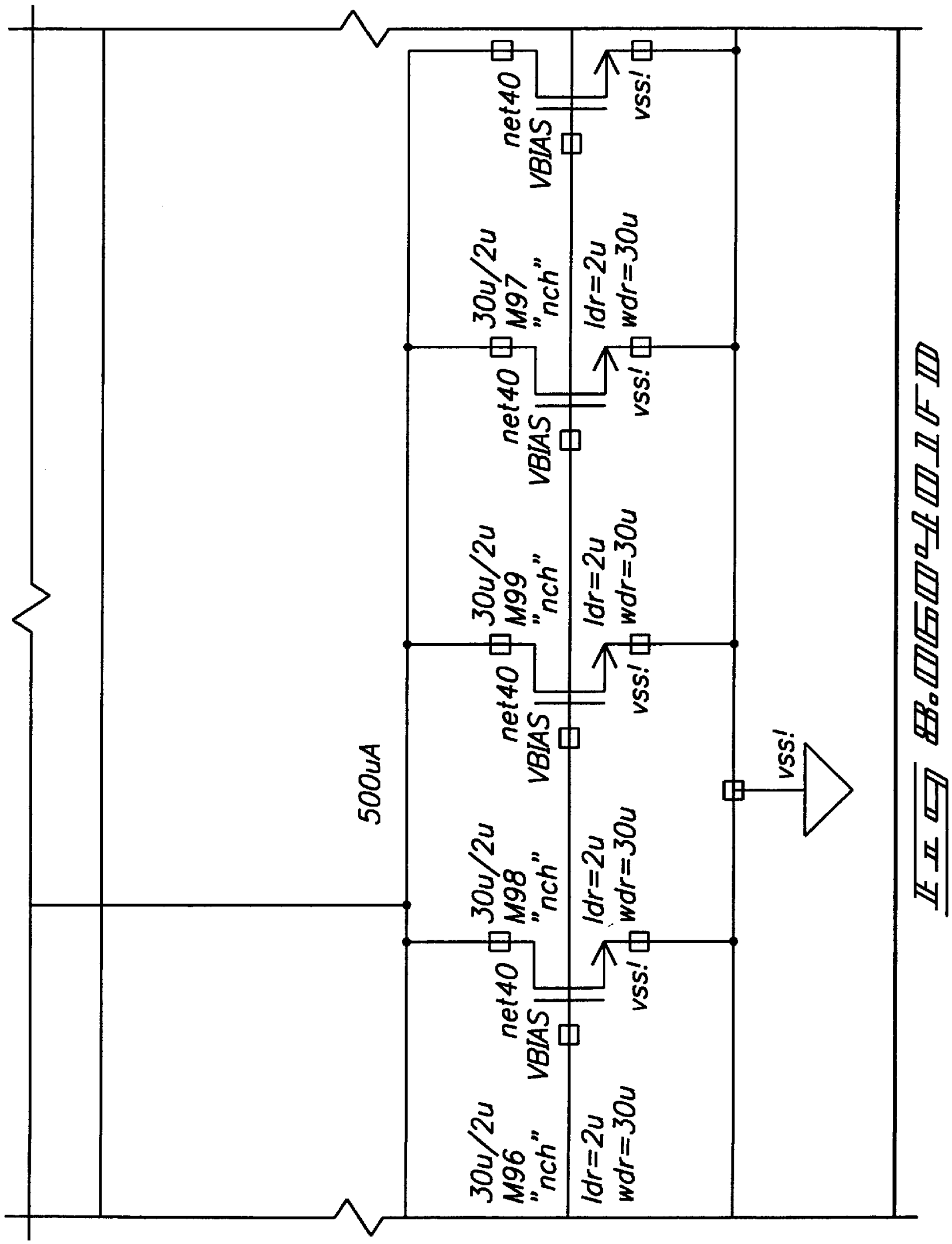
Fig 8.060401FD

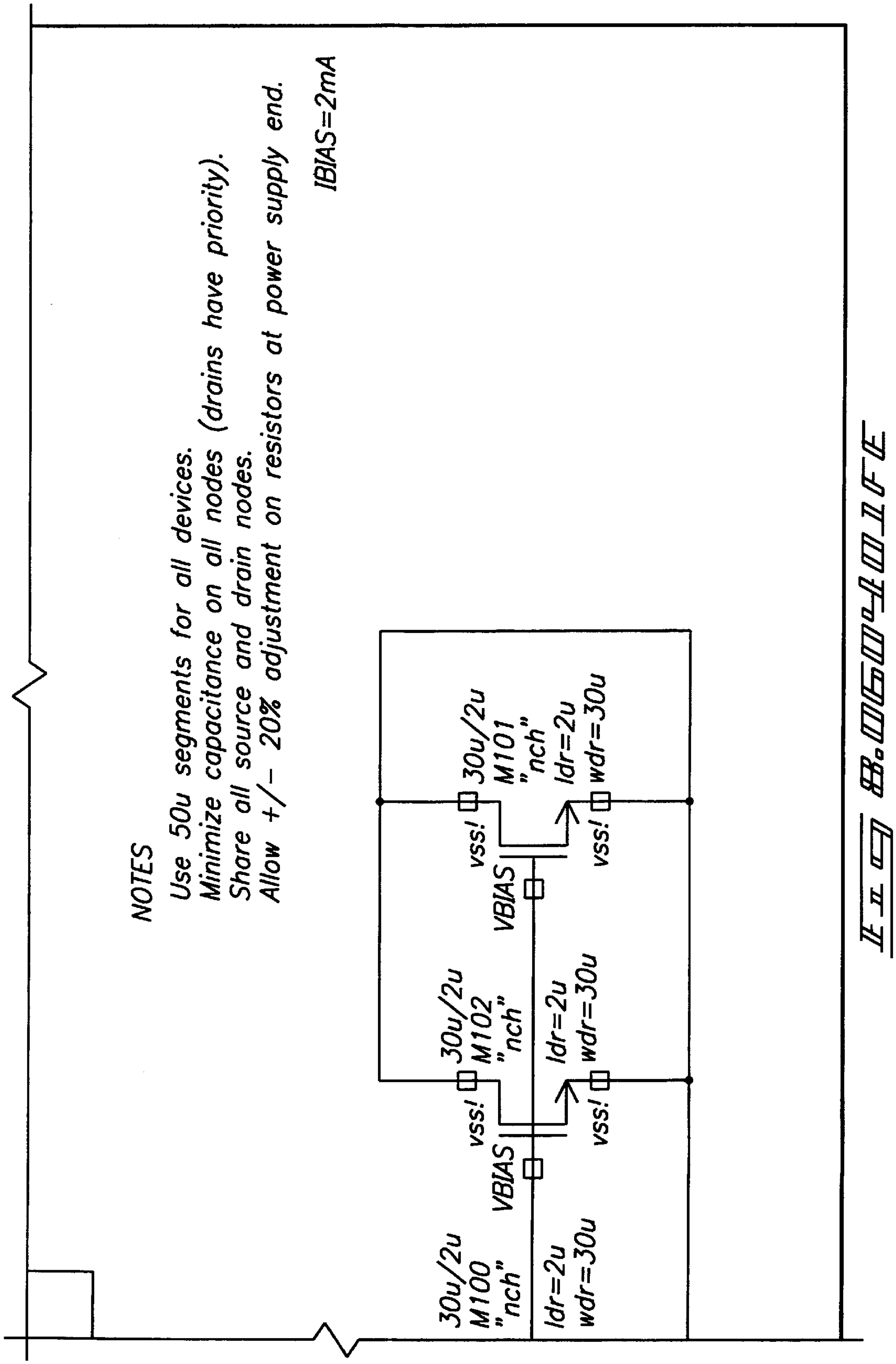
FIG. 8.0604.1FE

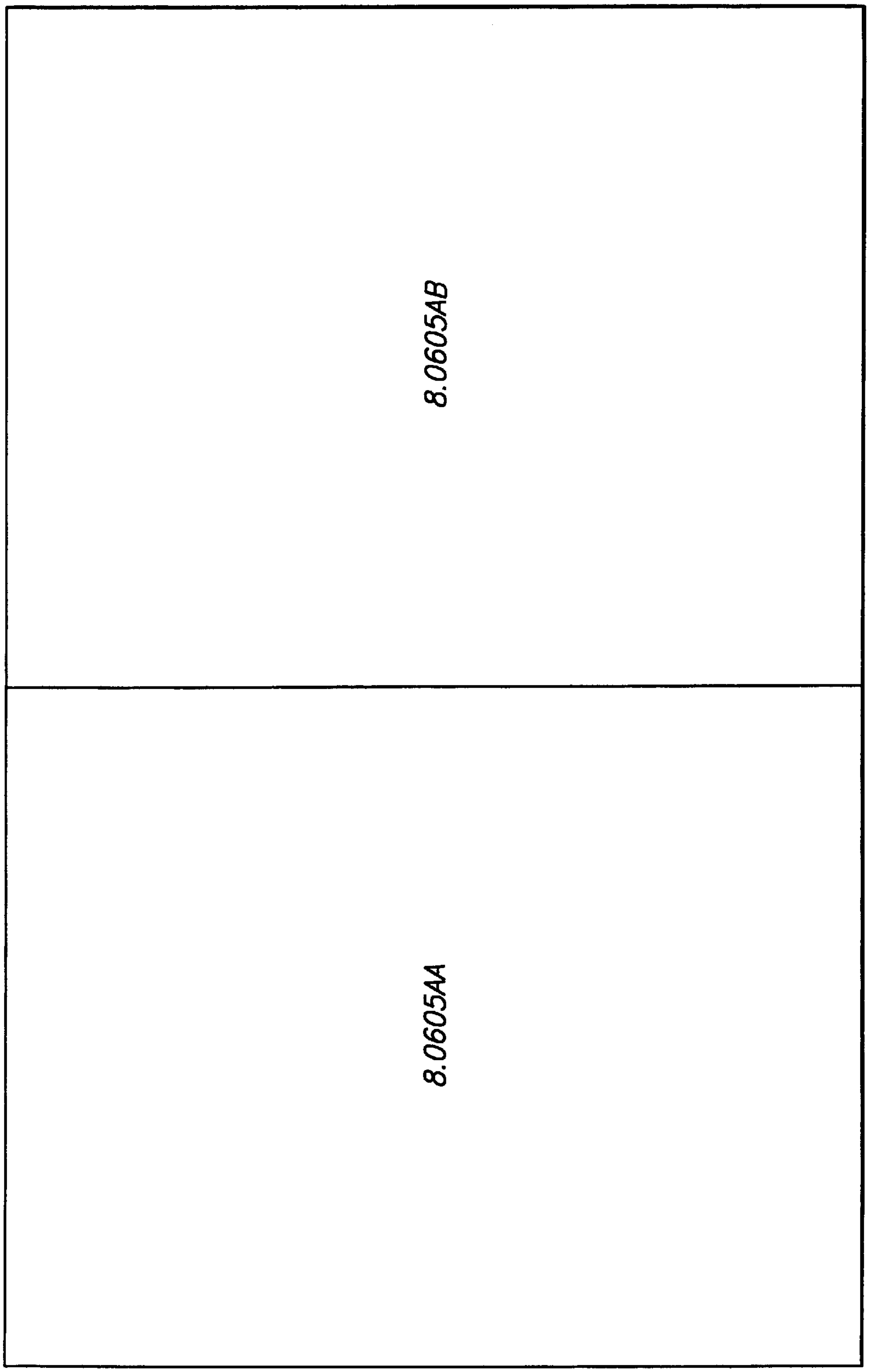
FIG. 8.0605

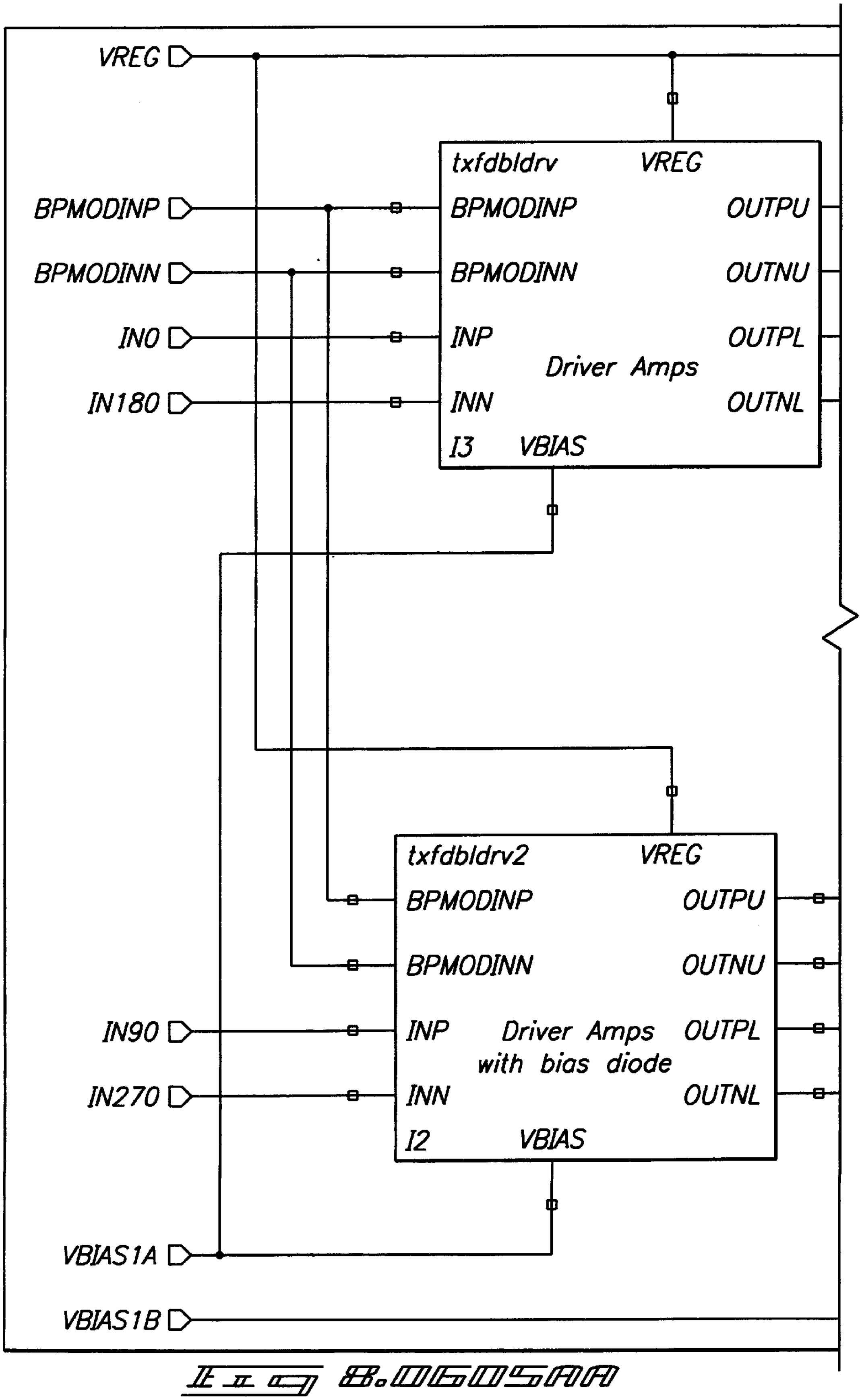
Fig 8.060SAA

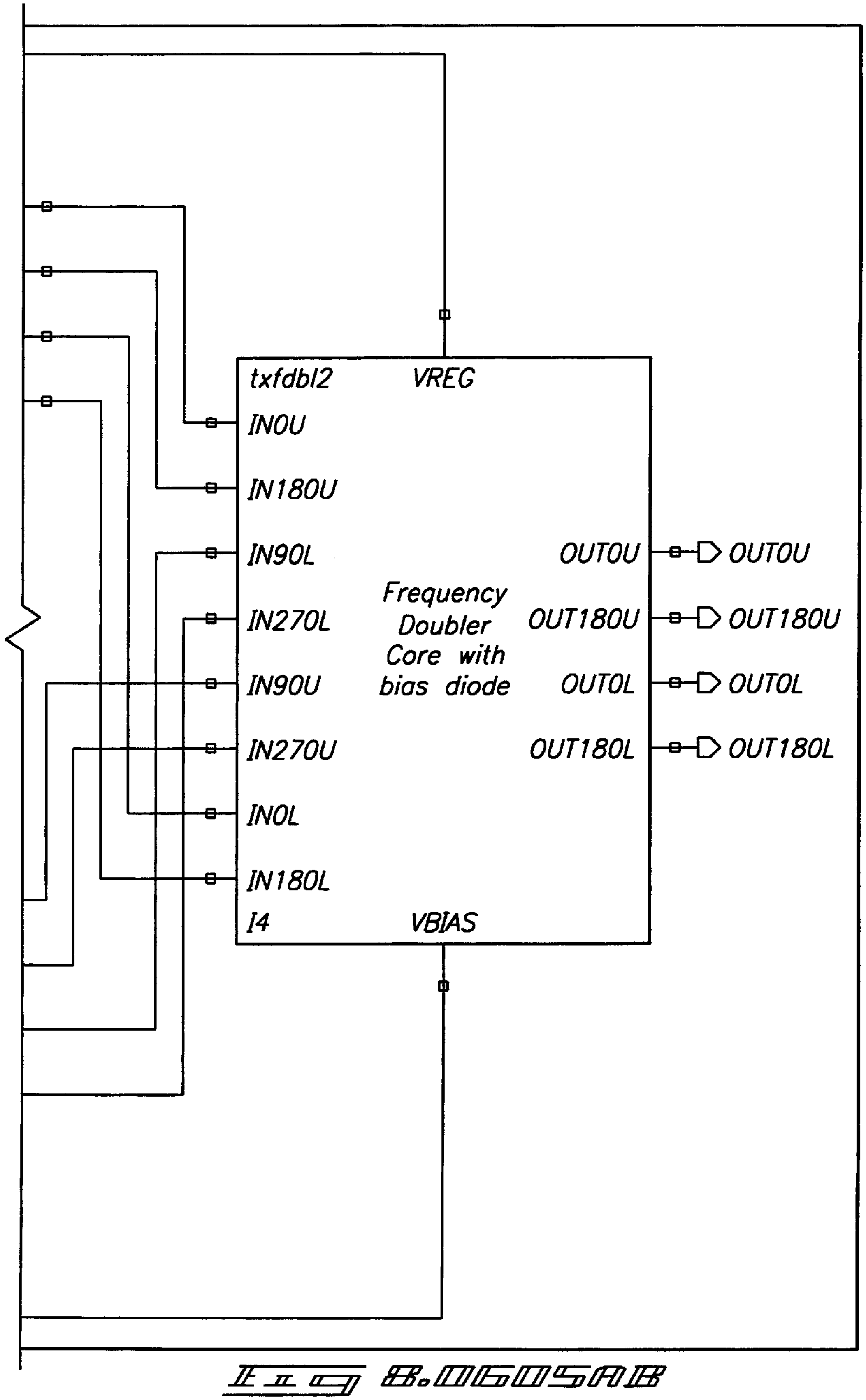
Fig 8.0605AB

| | | | |
|---|---|---|---|
| 8.060501AA | 8.060501AB | 8.060501AC | 8.060501AD |
| 8.060501BA | 8.060501BB | 8.060501BC | 8.060501BD |
| 8.060501CA | 8.060501CB | 8.060501CC | 8.060501CD |

Fig 8.060501

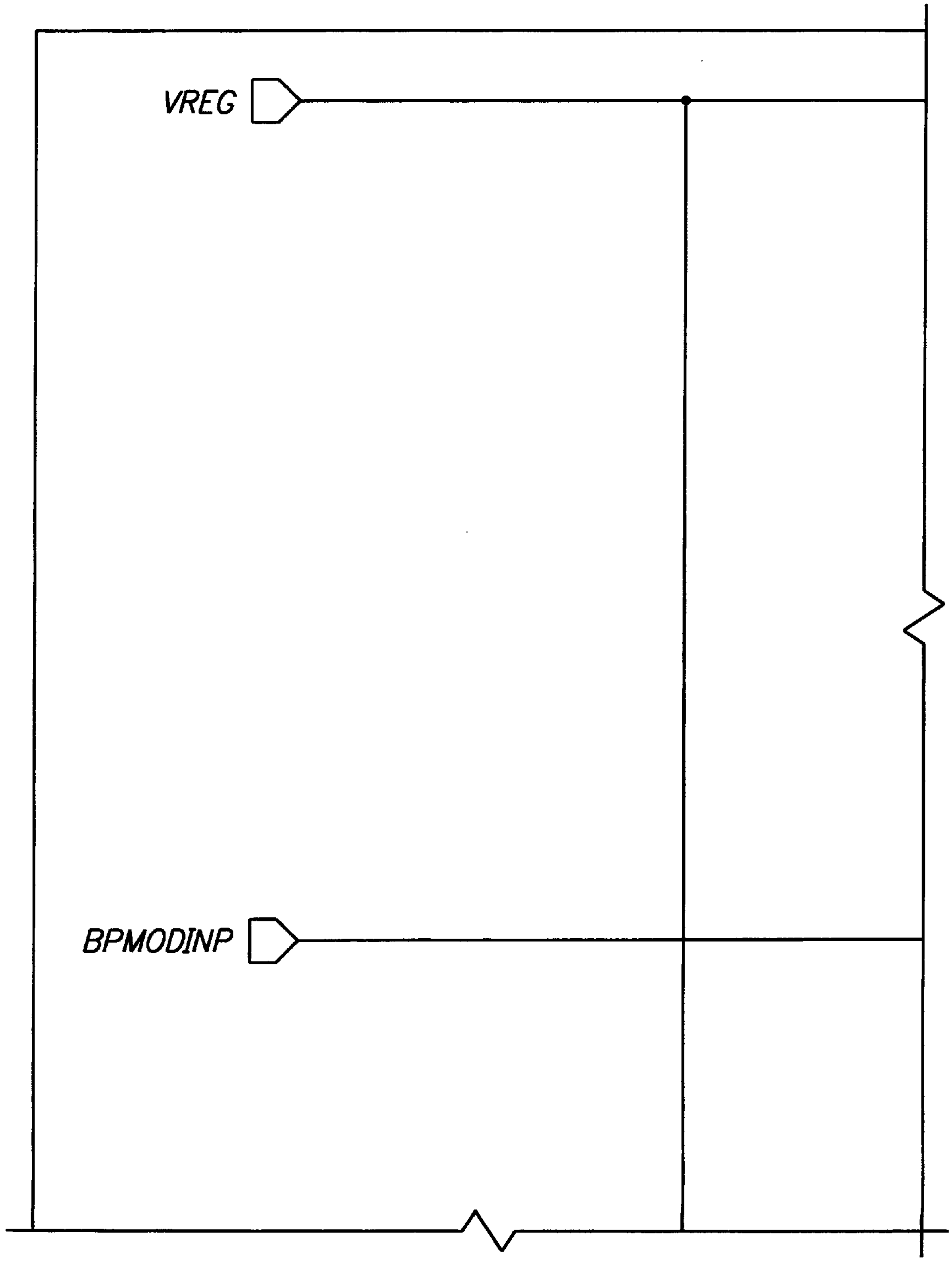
Fig 8.06050 1AA

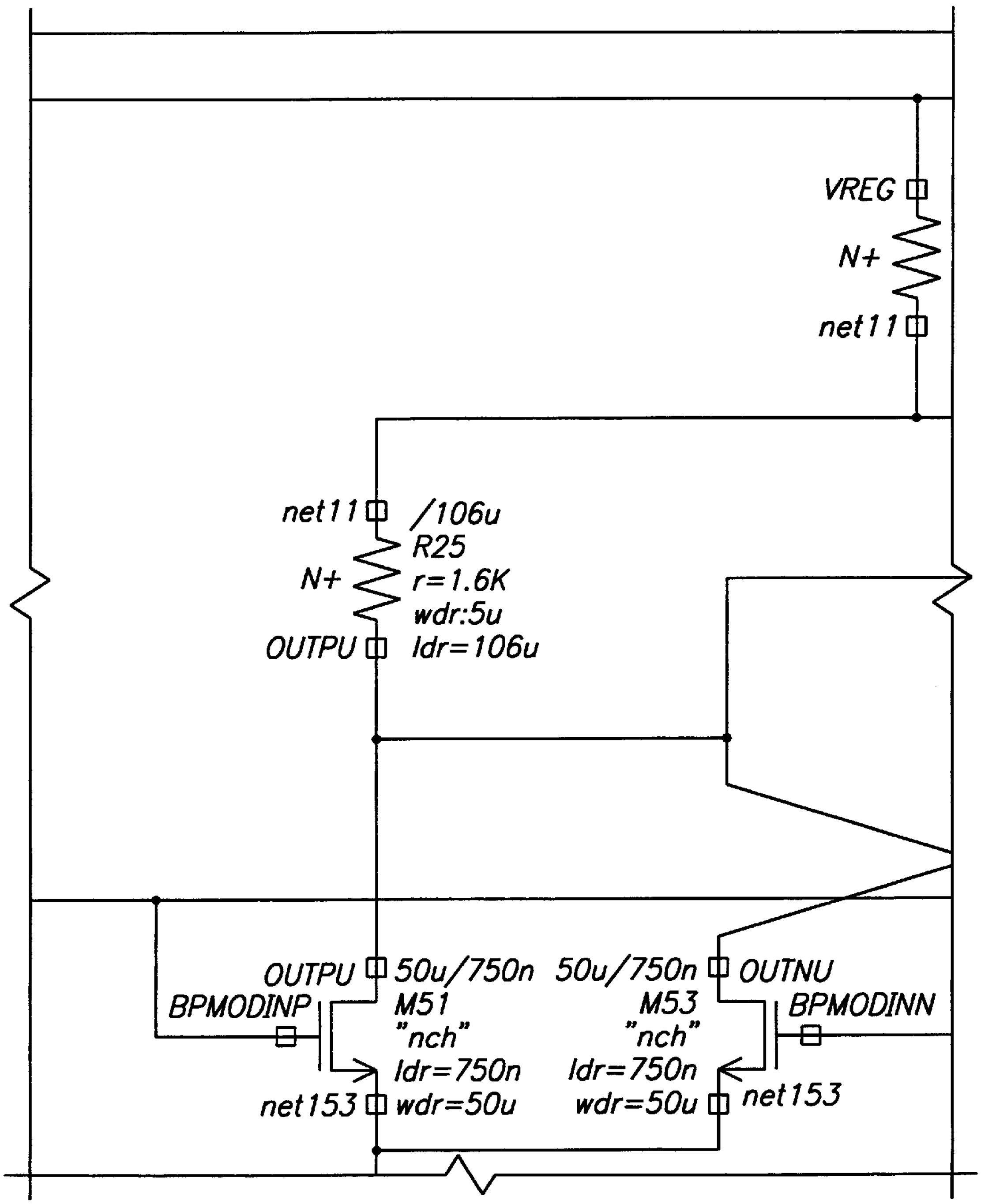
Fig 8.060501AB

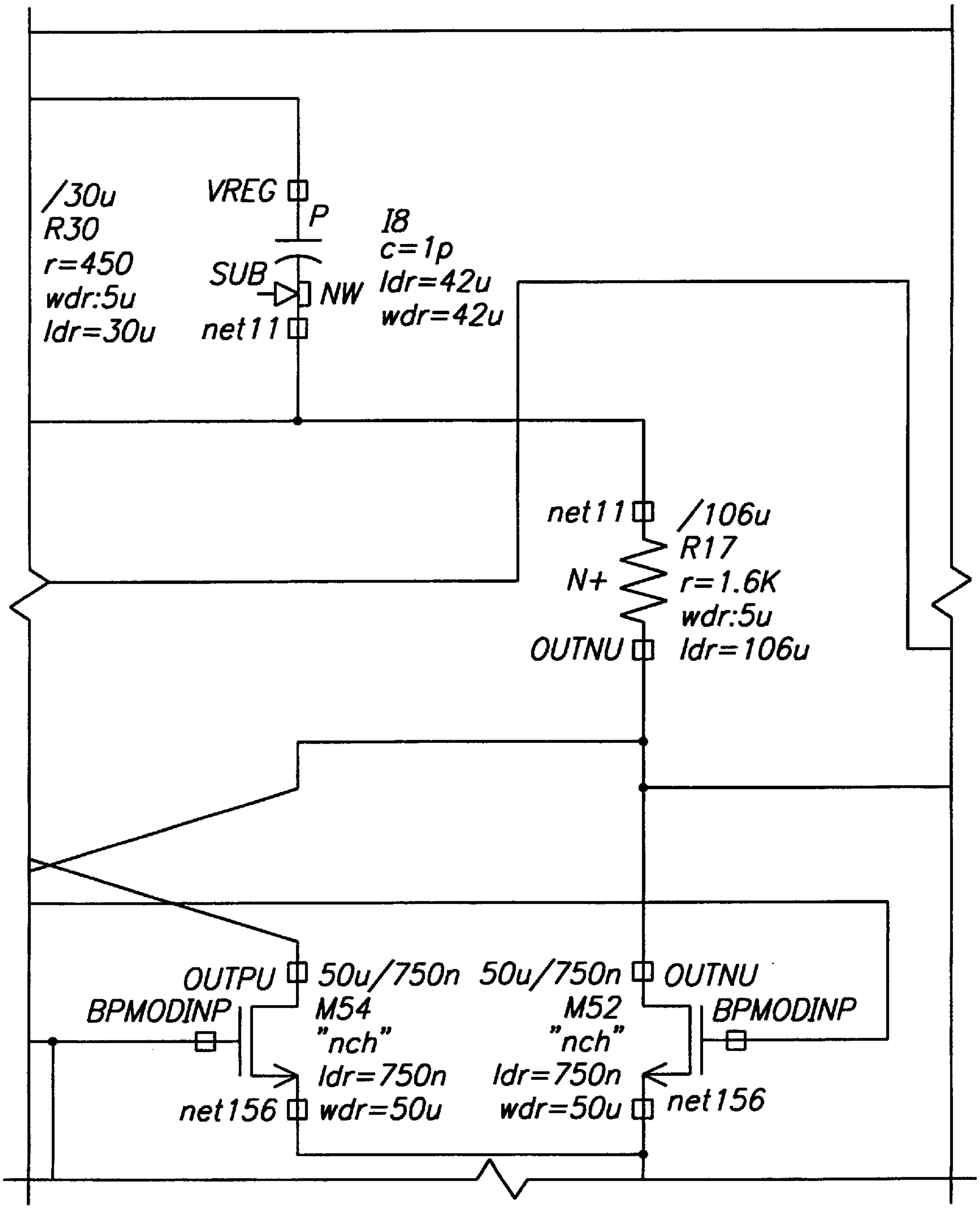
Fig 8.060501AC

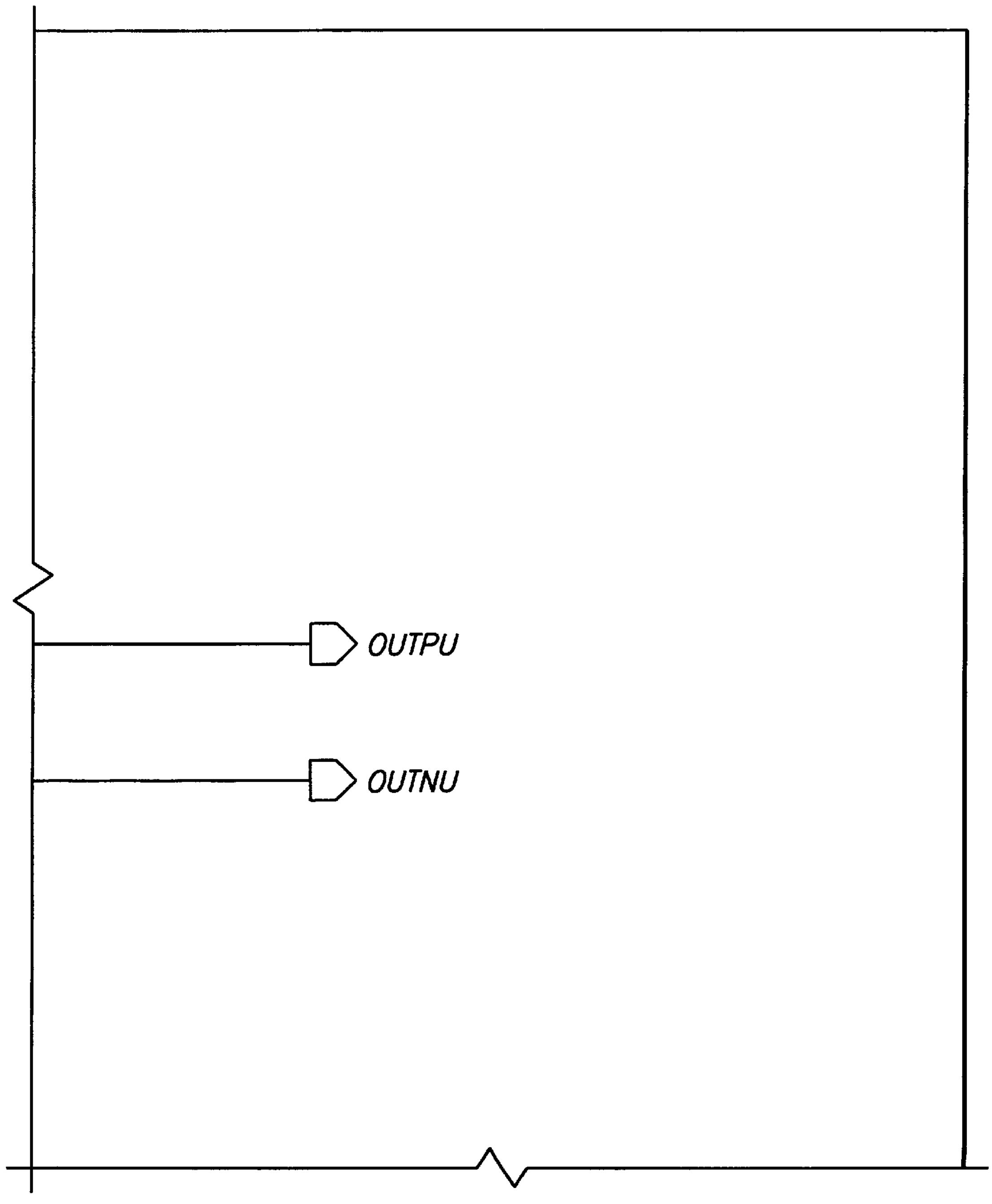
Fig 8.060501AD

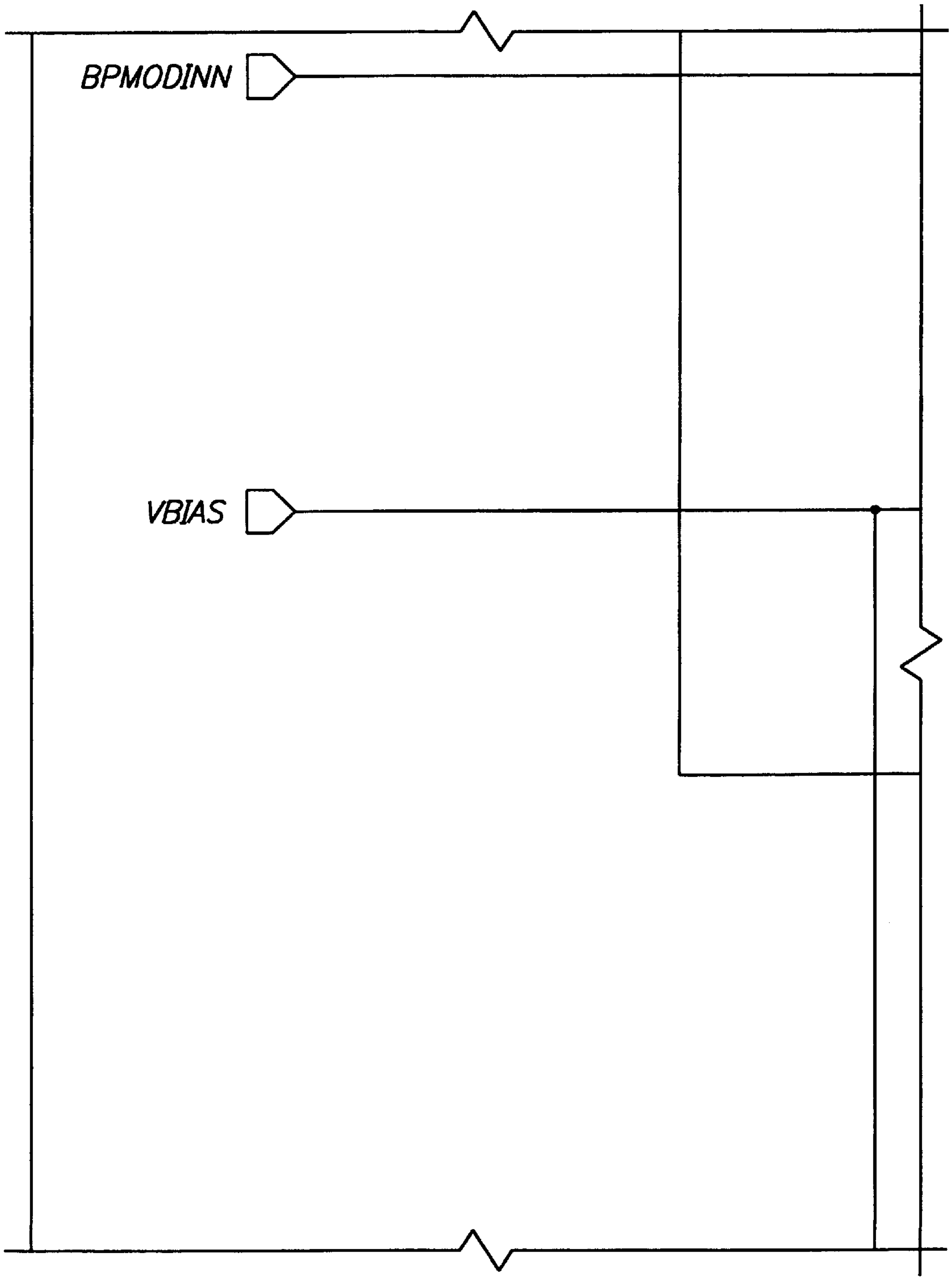
Fig 8.060501BA

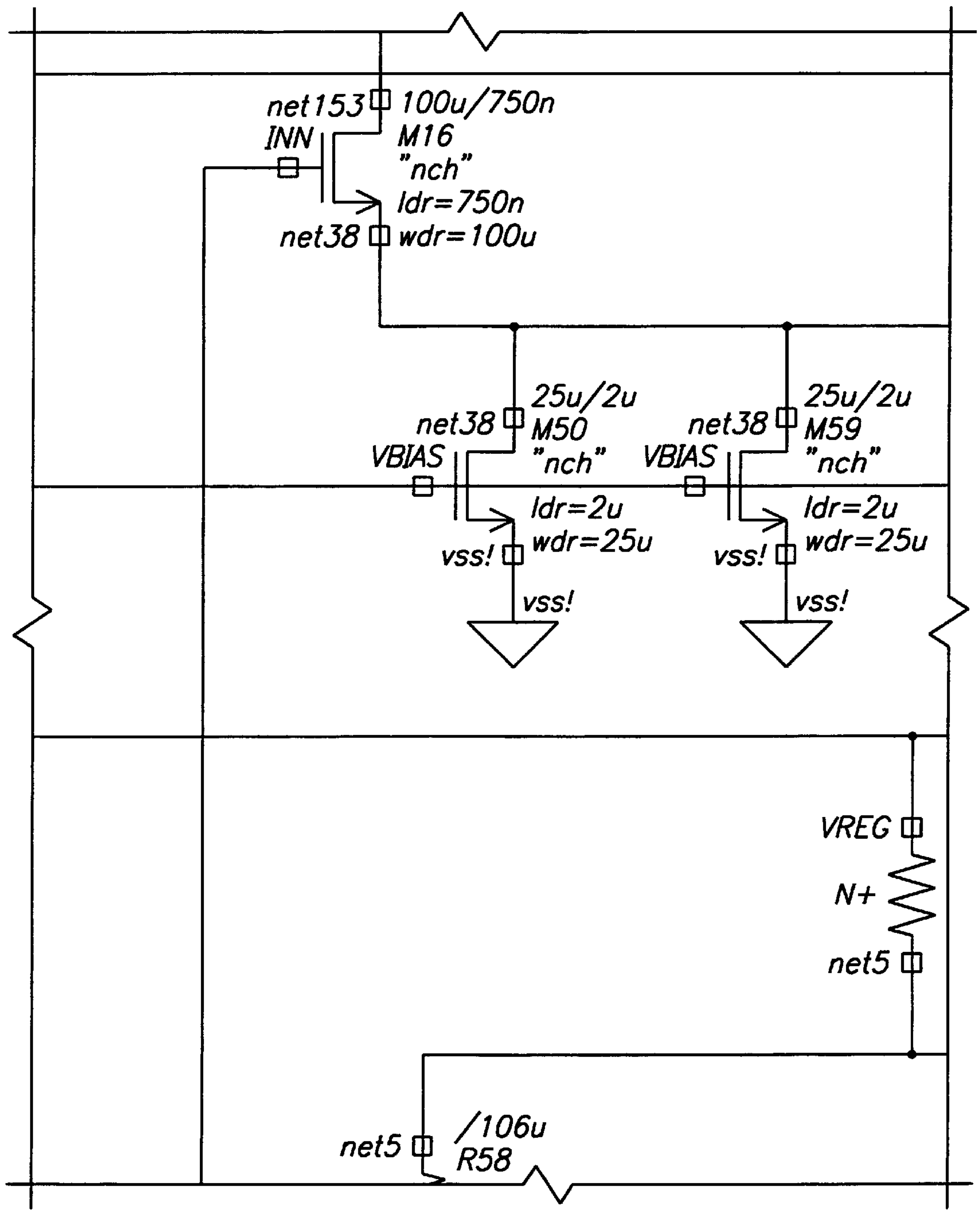
Fig 8.060501BB

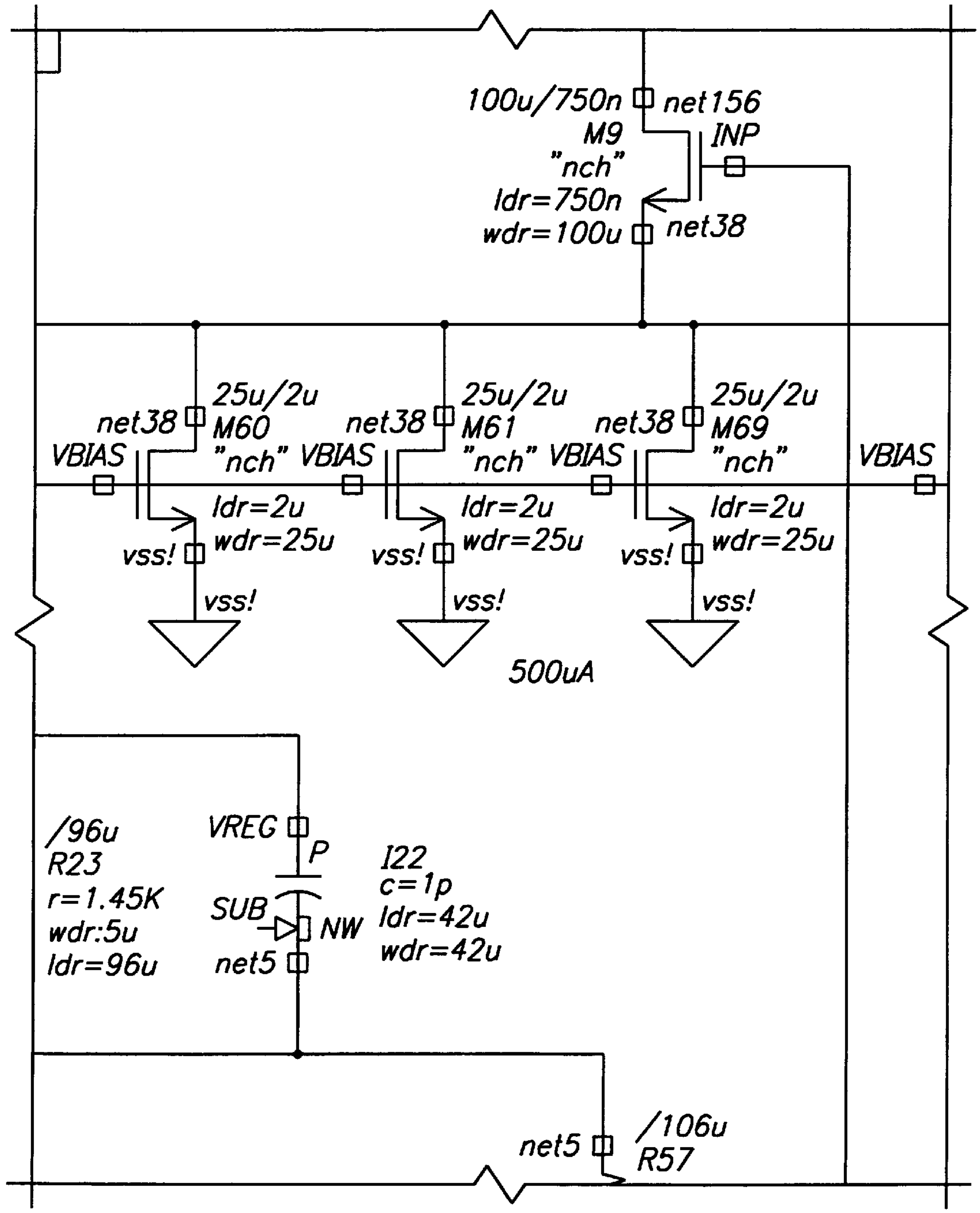
Fig 8.060501BC

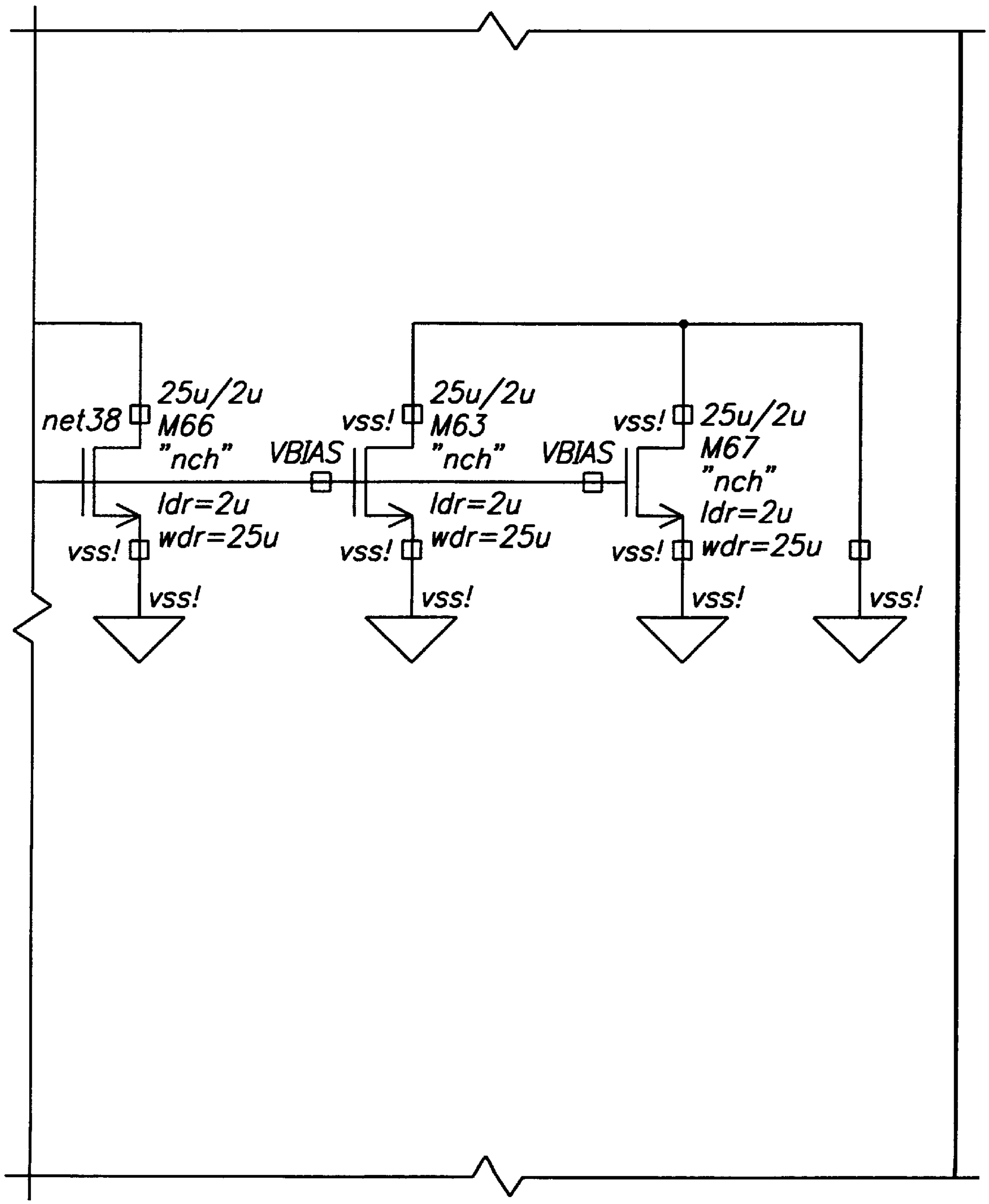
Fig 8.060501BD

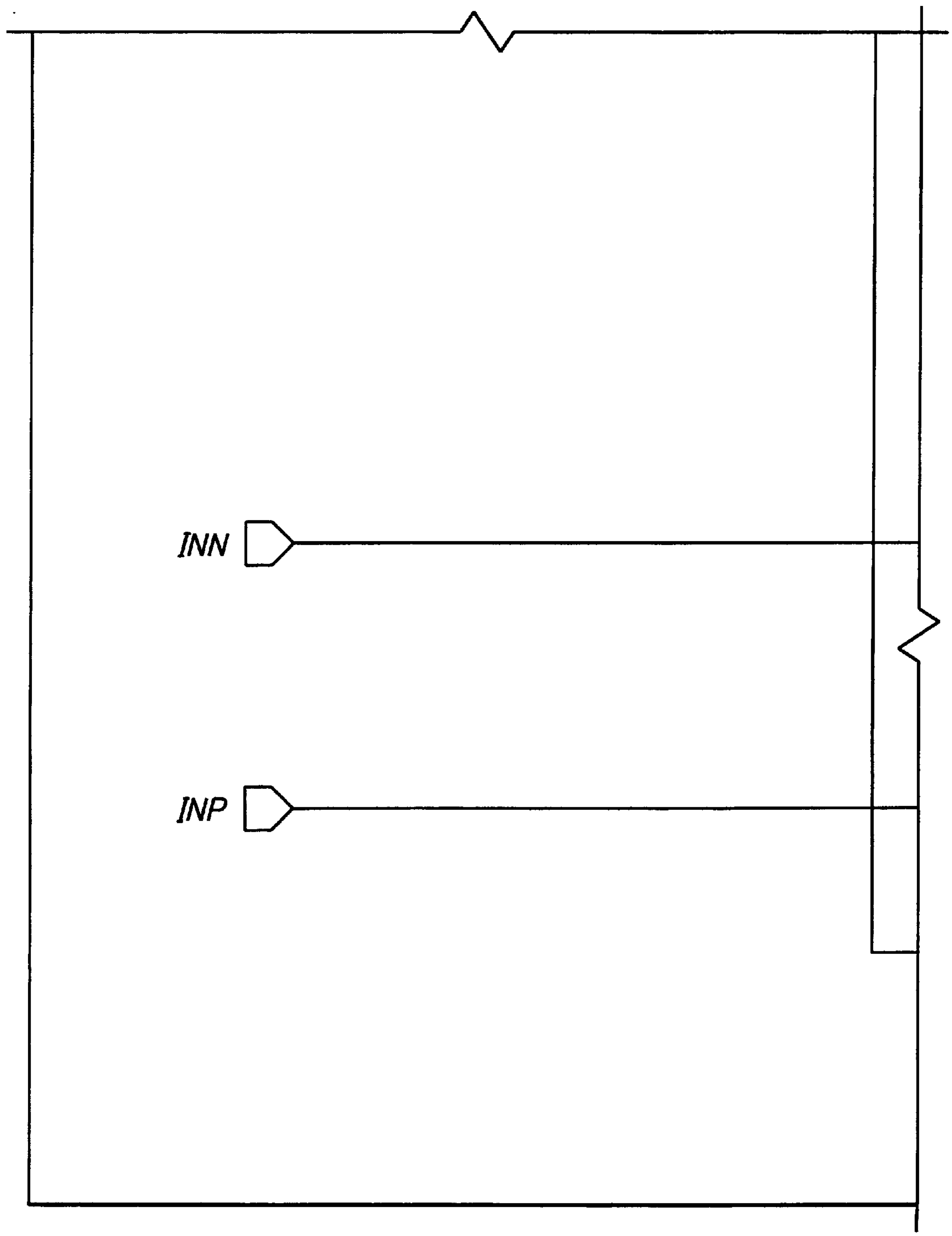
Fig 8.060501CA

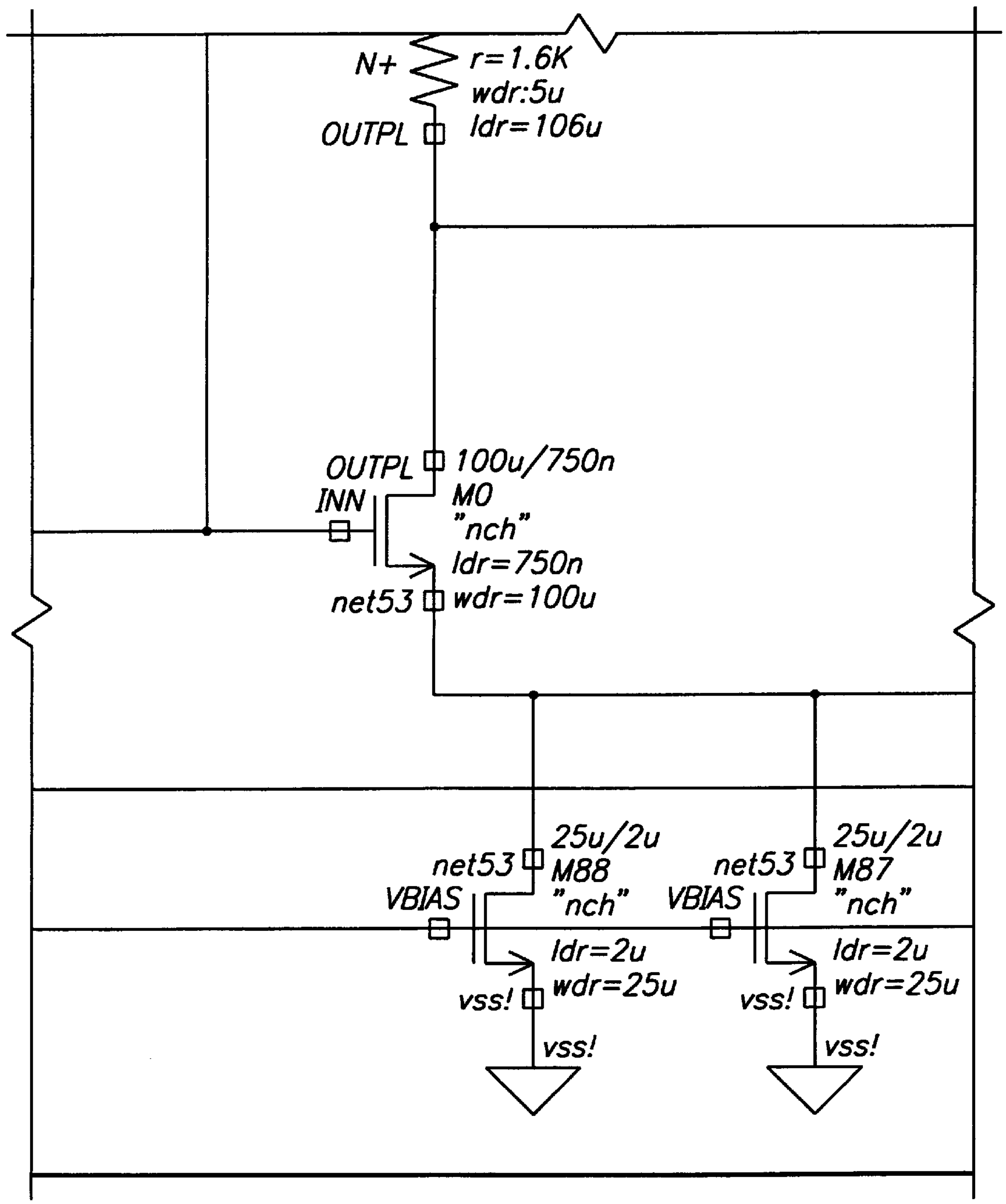
Fig 8.060501CB

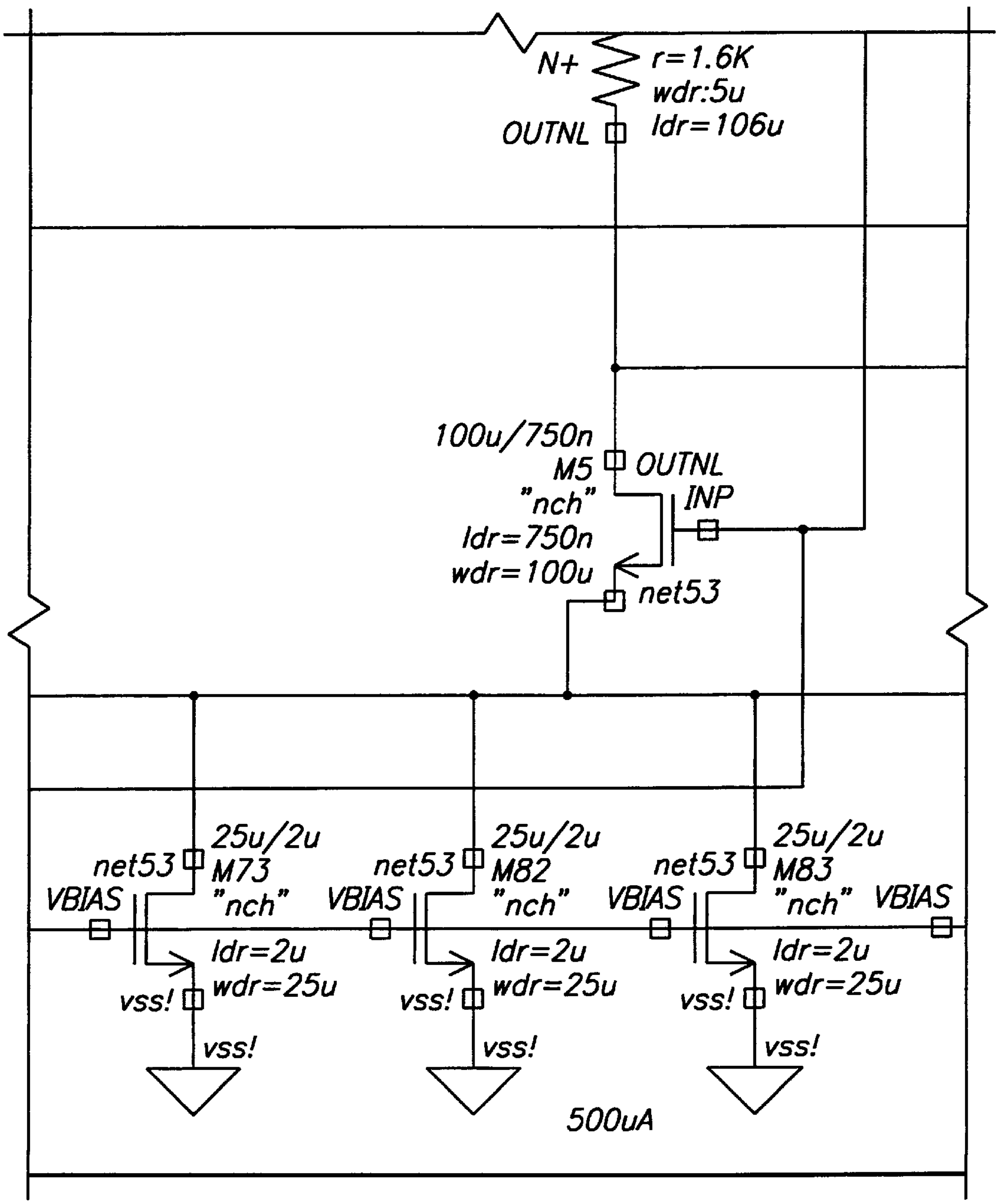
Fig 8.060501CC

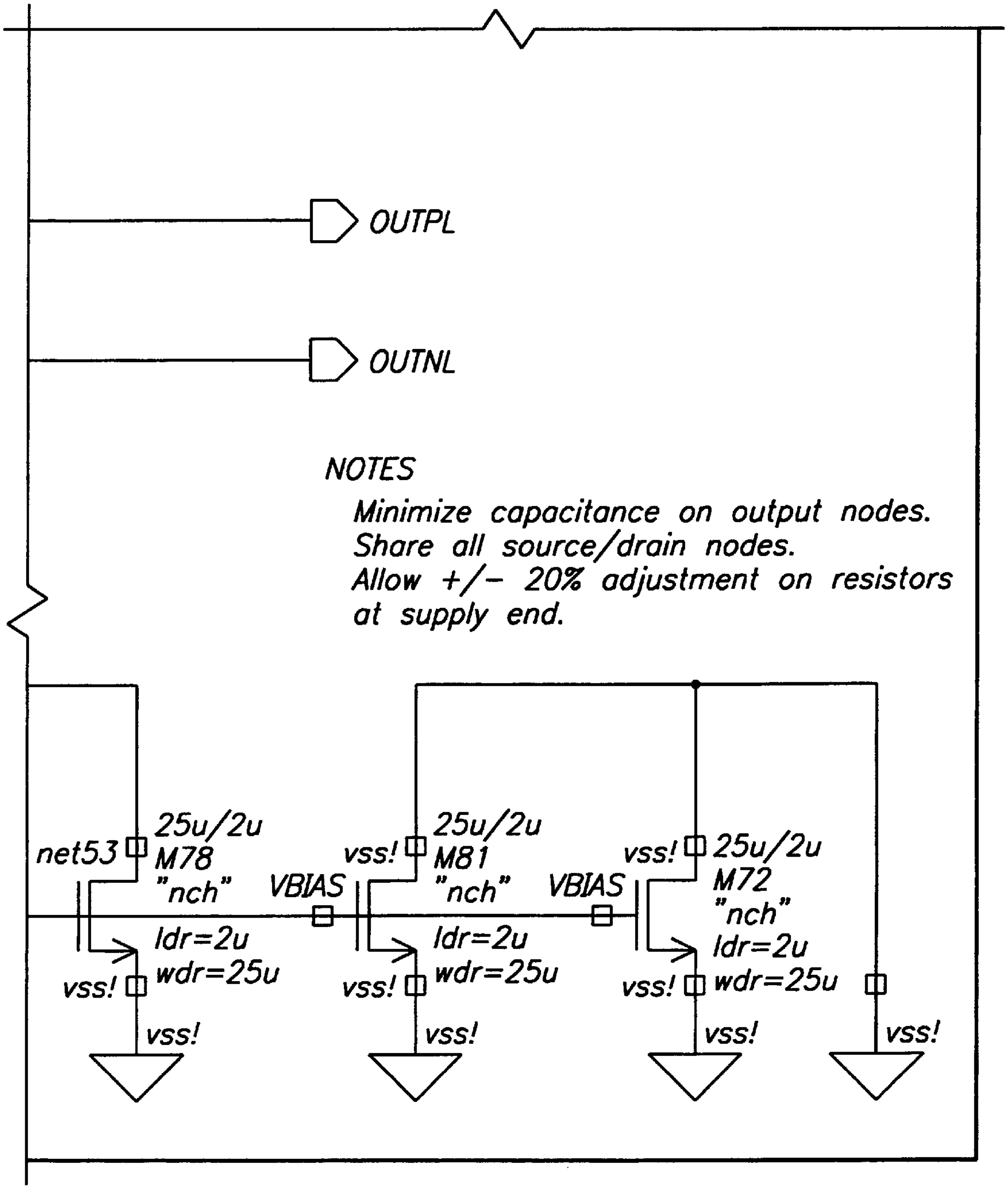
Fig 8.060501CD

| | | | |
|---|---|---|---|
| 8.060502AA | 8.060502AB | 8.060502AC | 8.060502AD |
| 8.060502BA | 8.060502BB | 8.060502BC | 8.060502BD |
| 8.060502CA | 8.060502CB | 8.060502CC | 8.060502CD |

Fig 8.060502

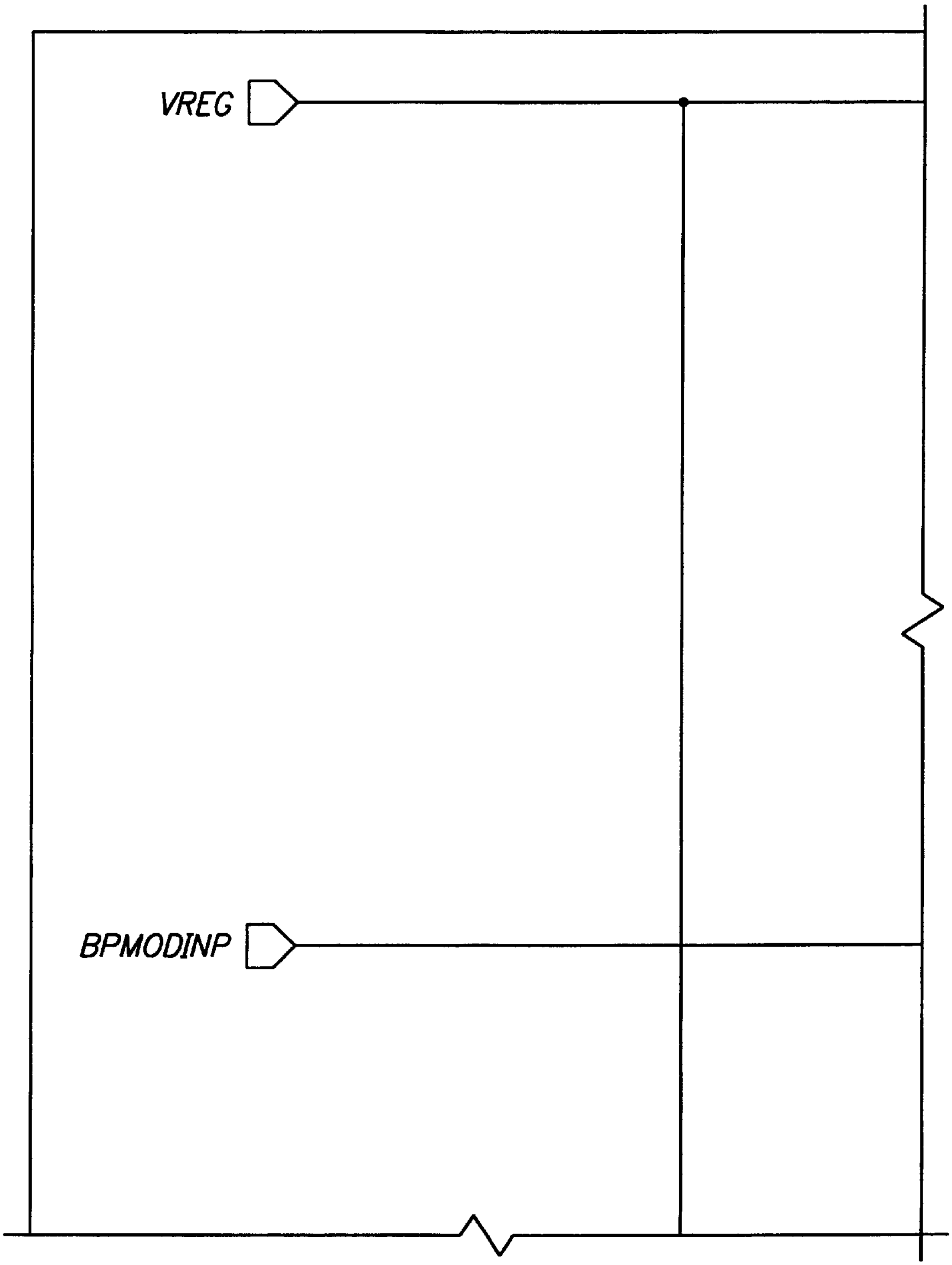
Fig 8.060502AA

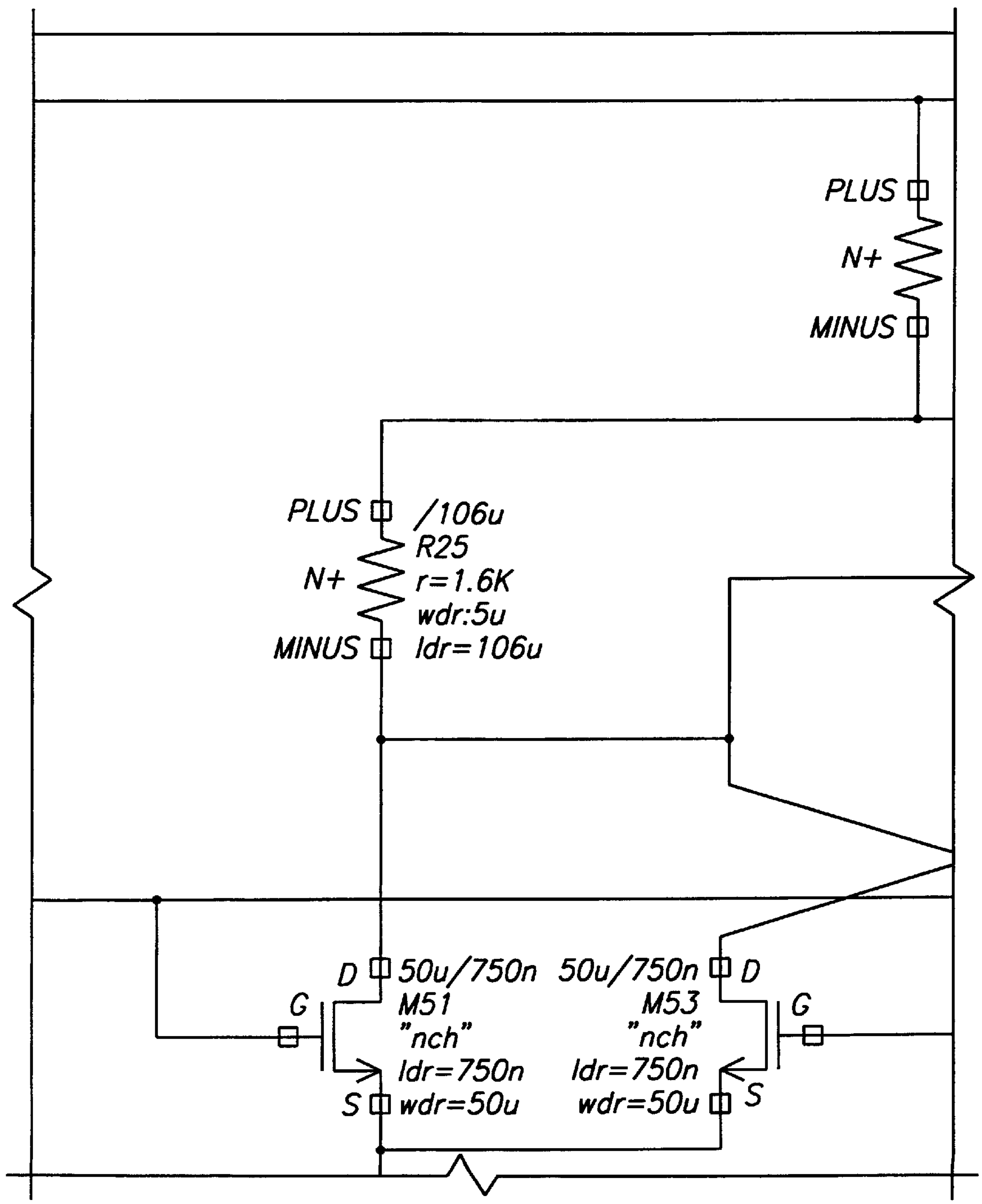
Fig 8.06050 2AB

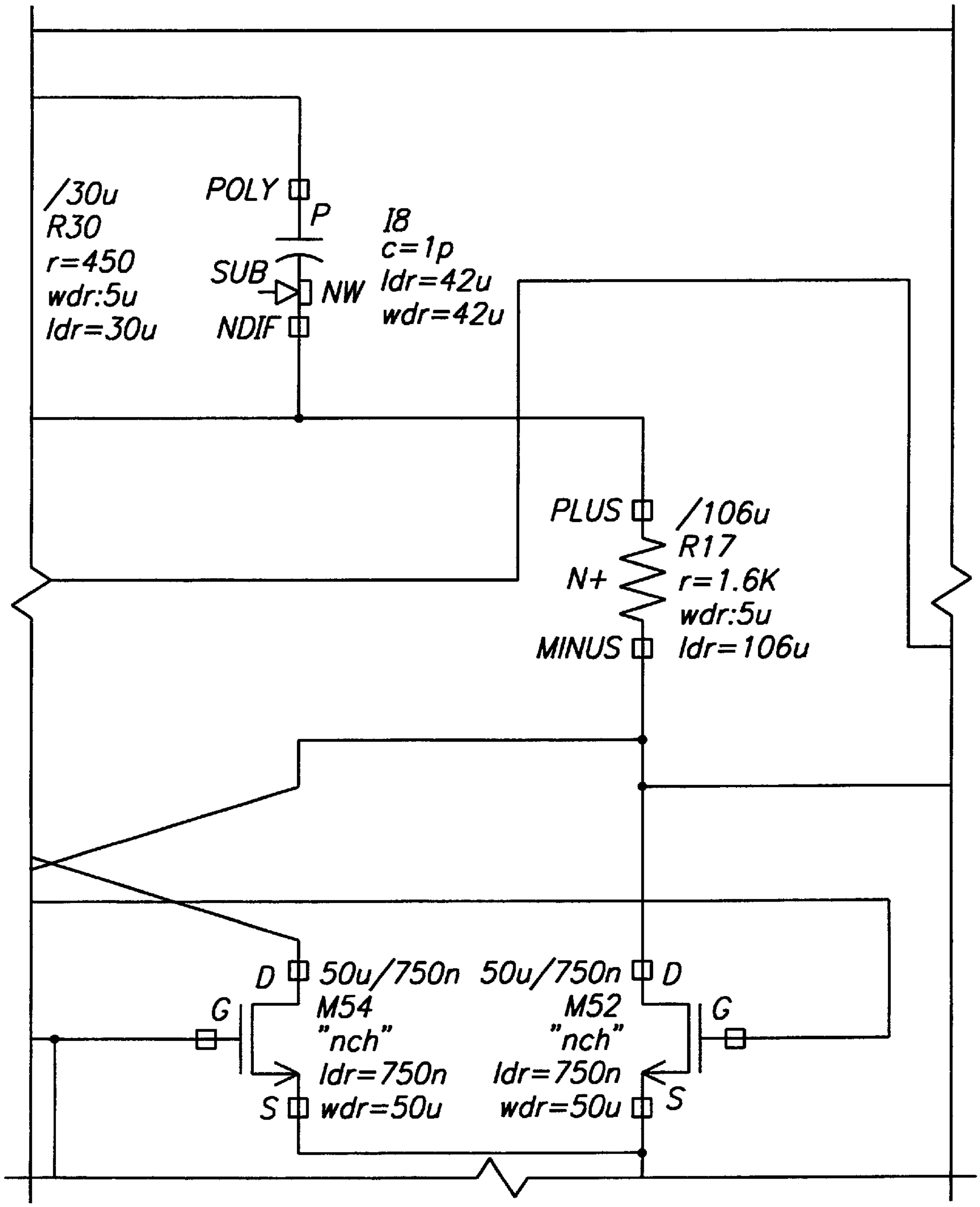
Fig 8.060502AC

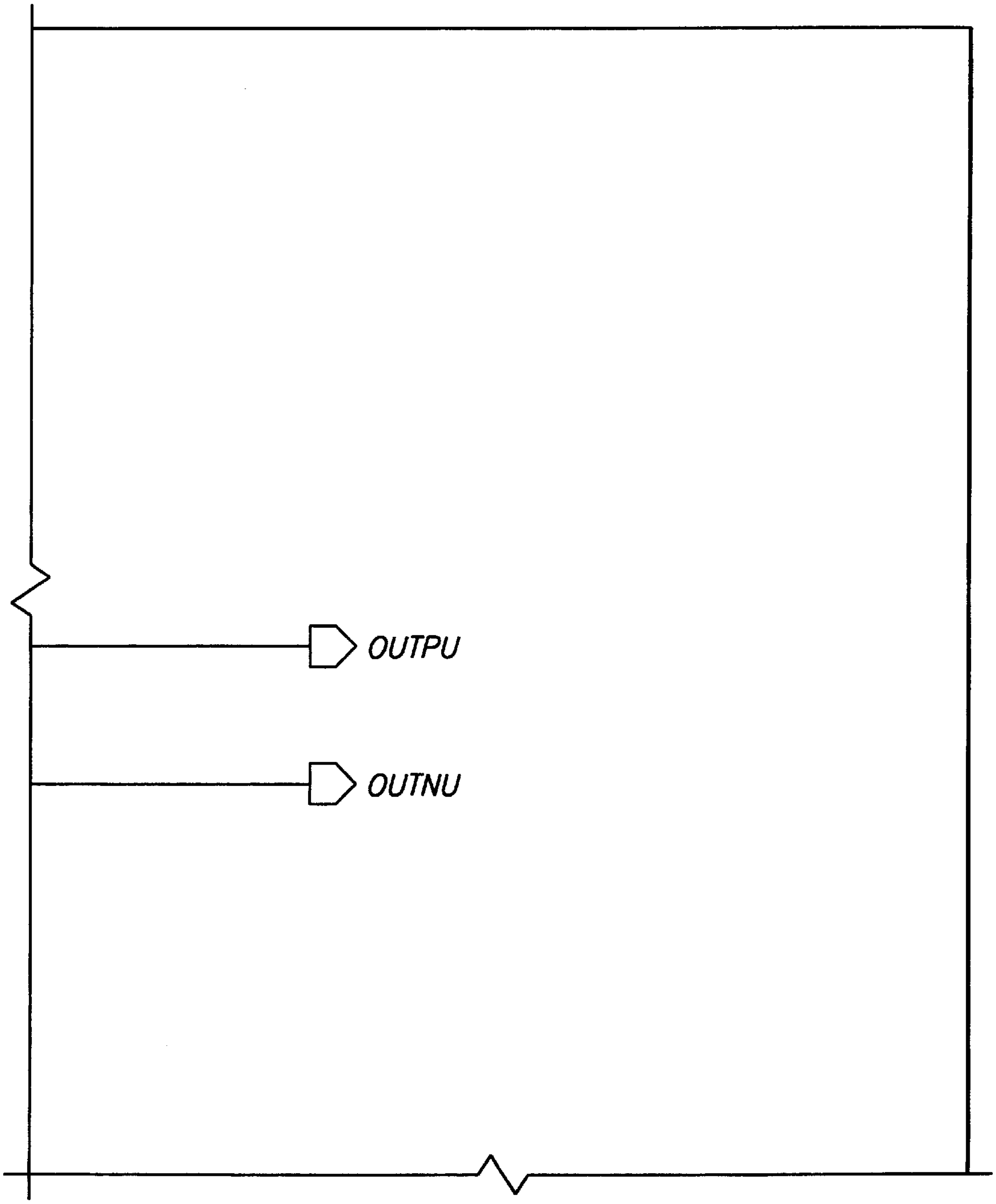
Fig 8.060502AD

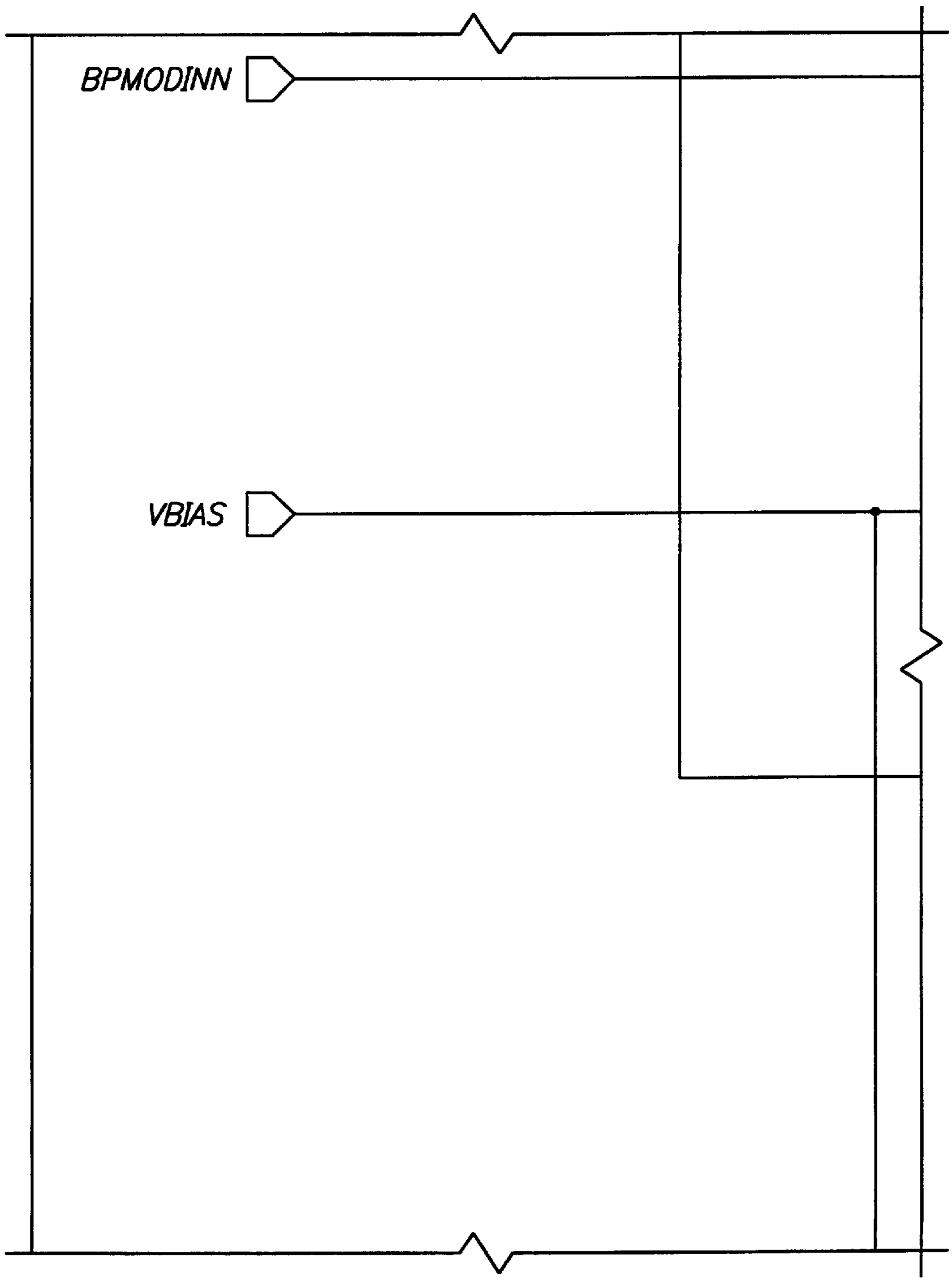
FIG 8.060502BA

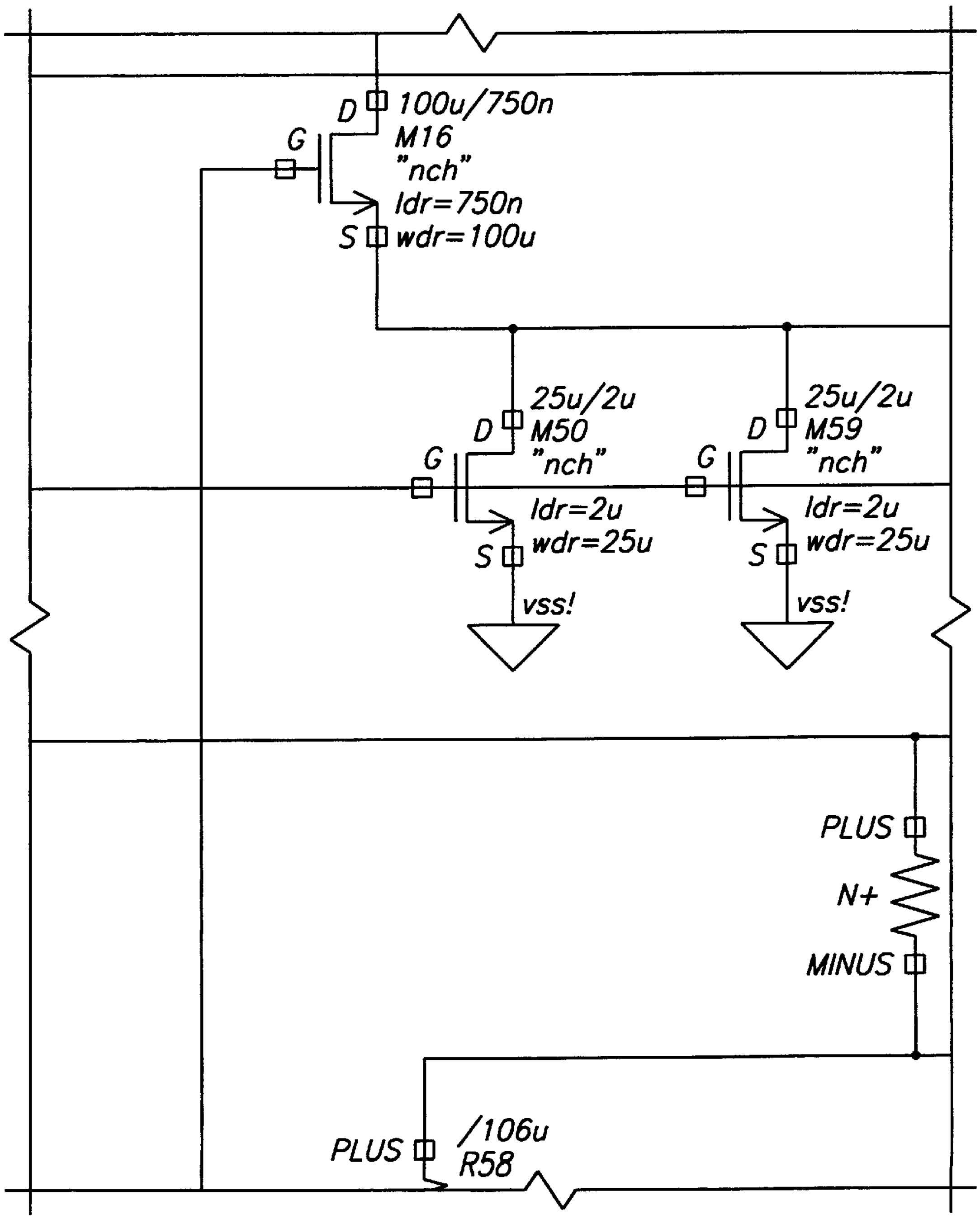
Fig 8.060502BB

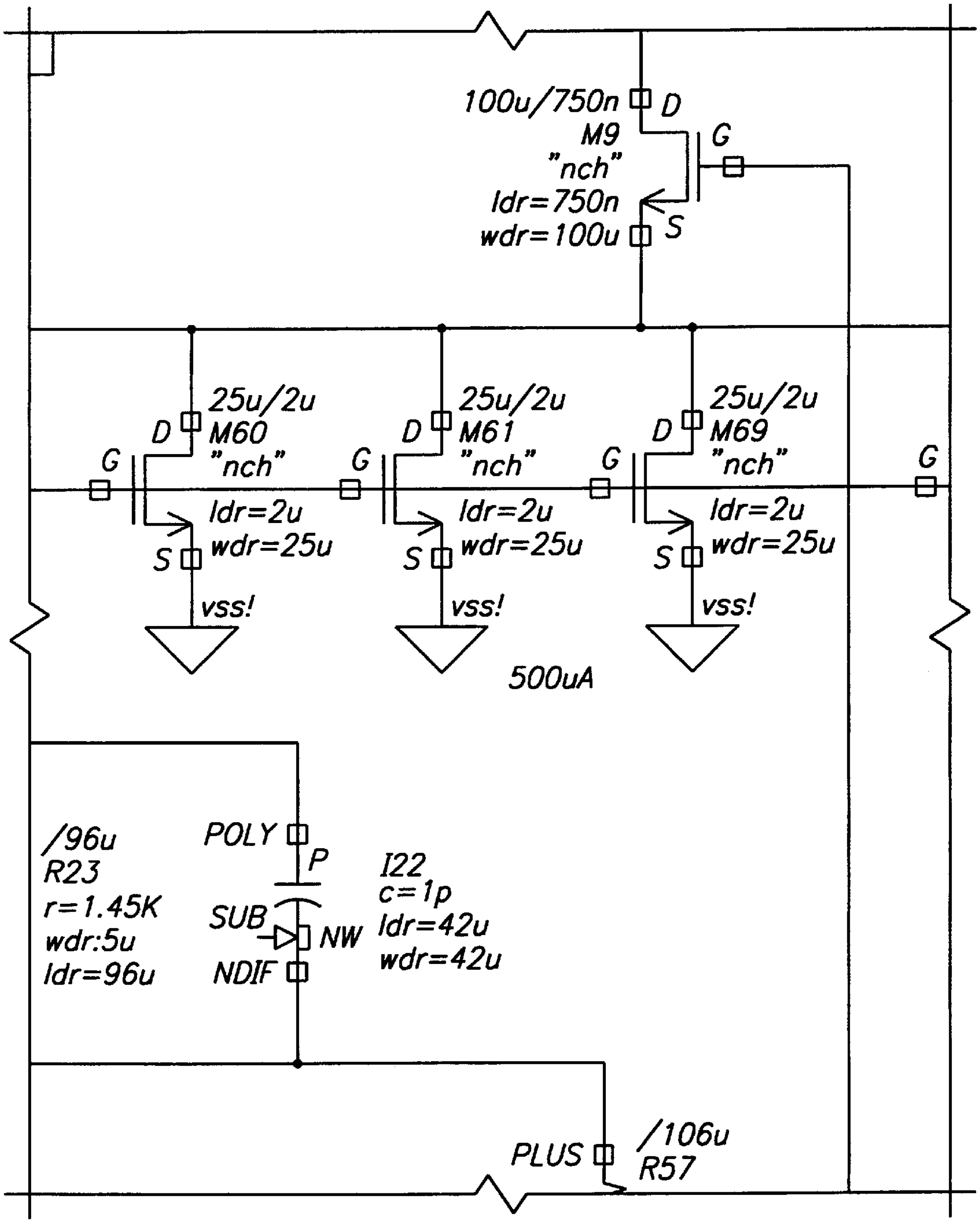
Fig 8.060502BC

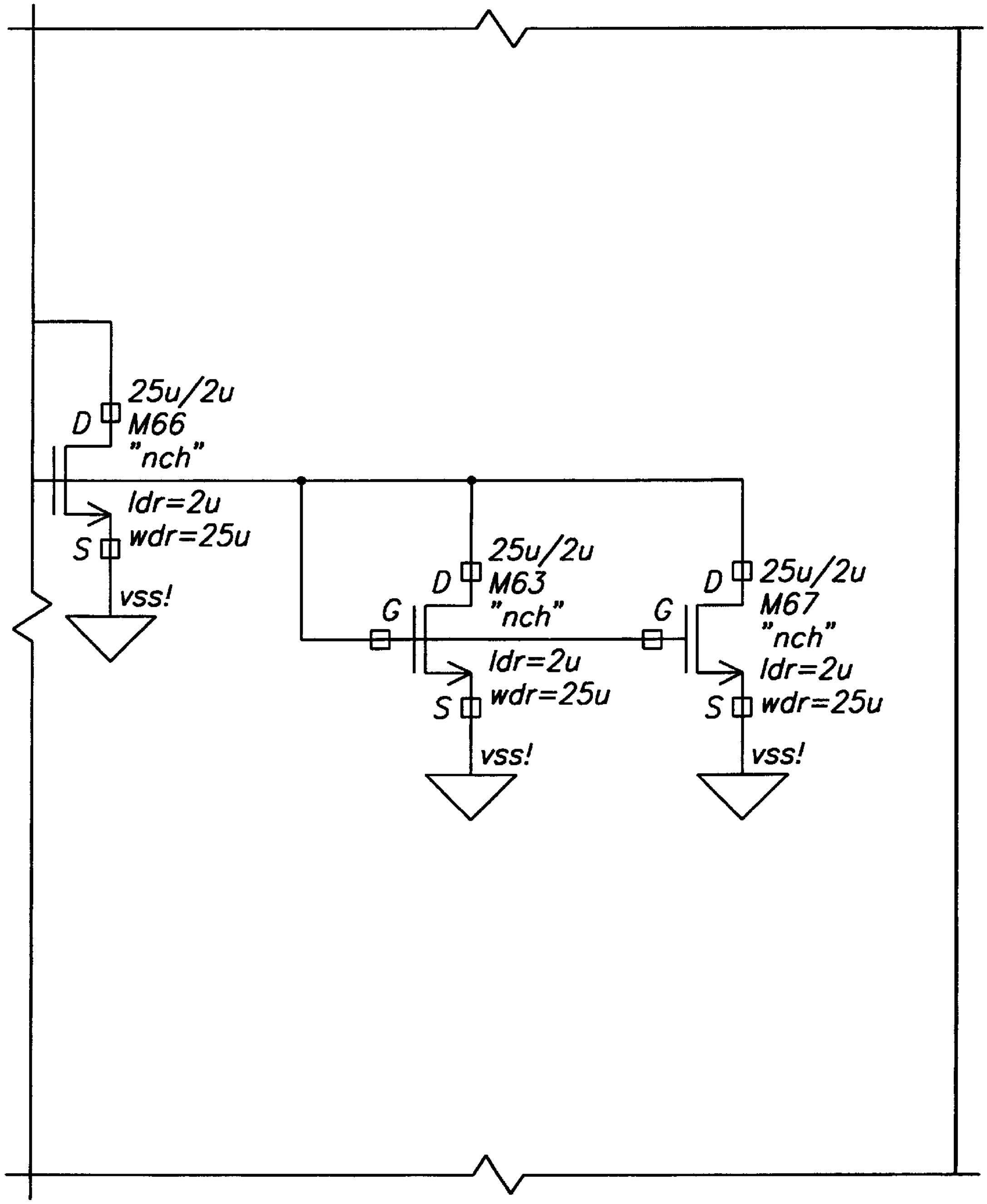
Fig 8.060502BD

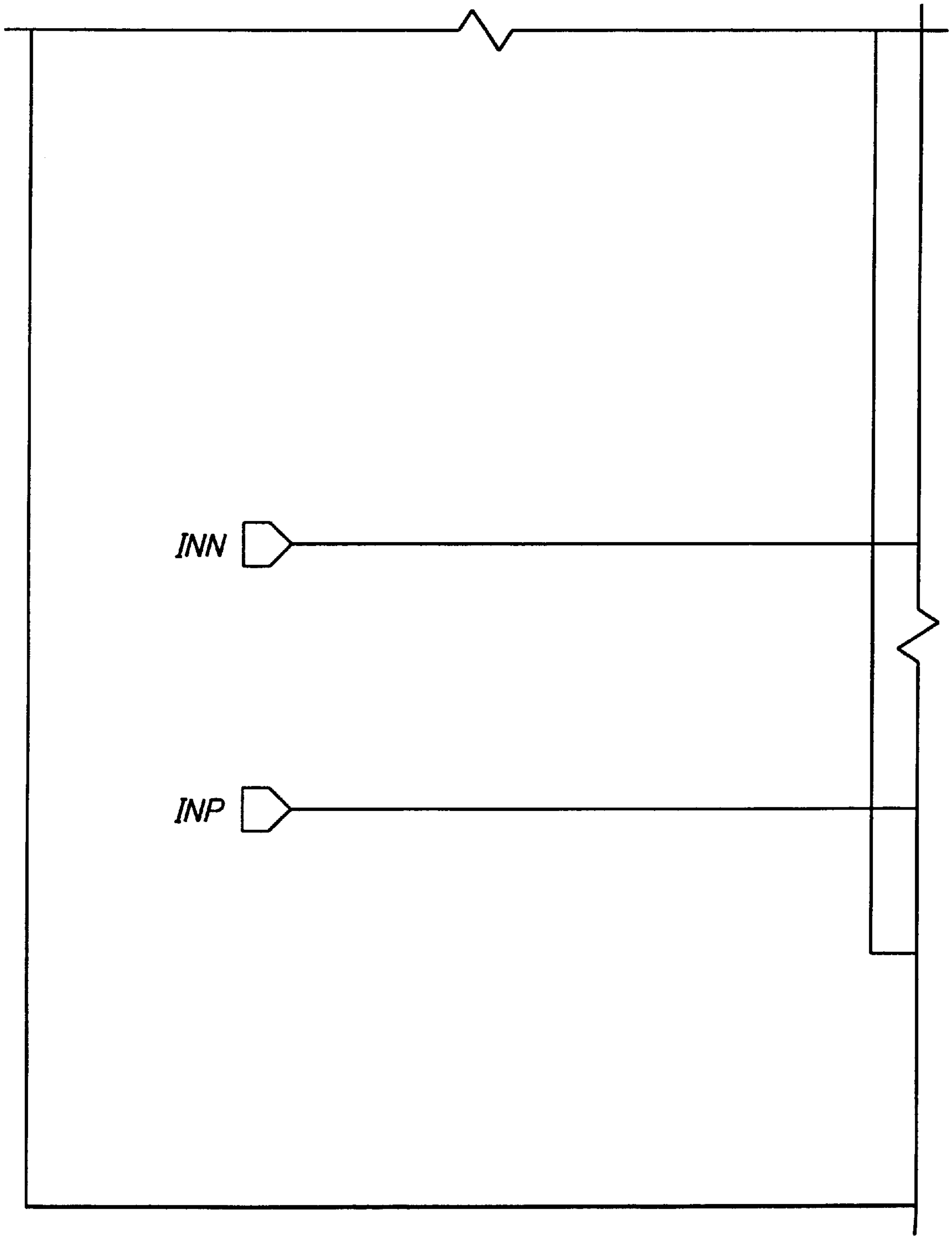
Fig 8.060502CA

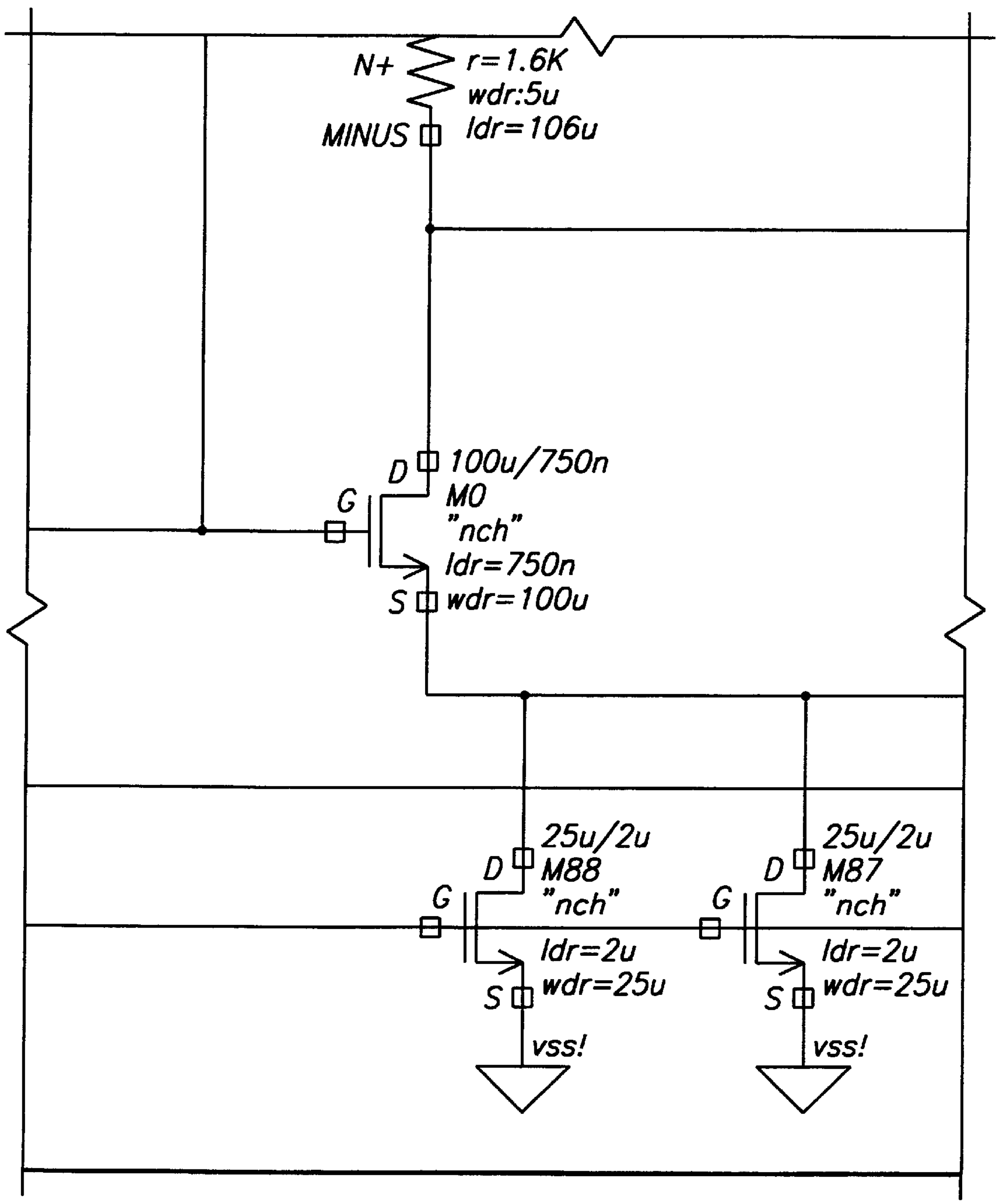
Fig 8.060502CB

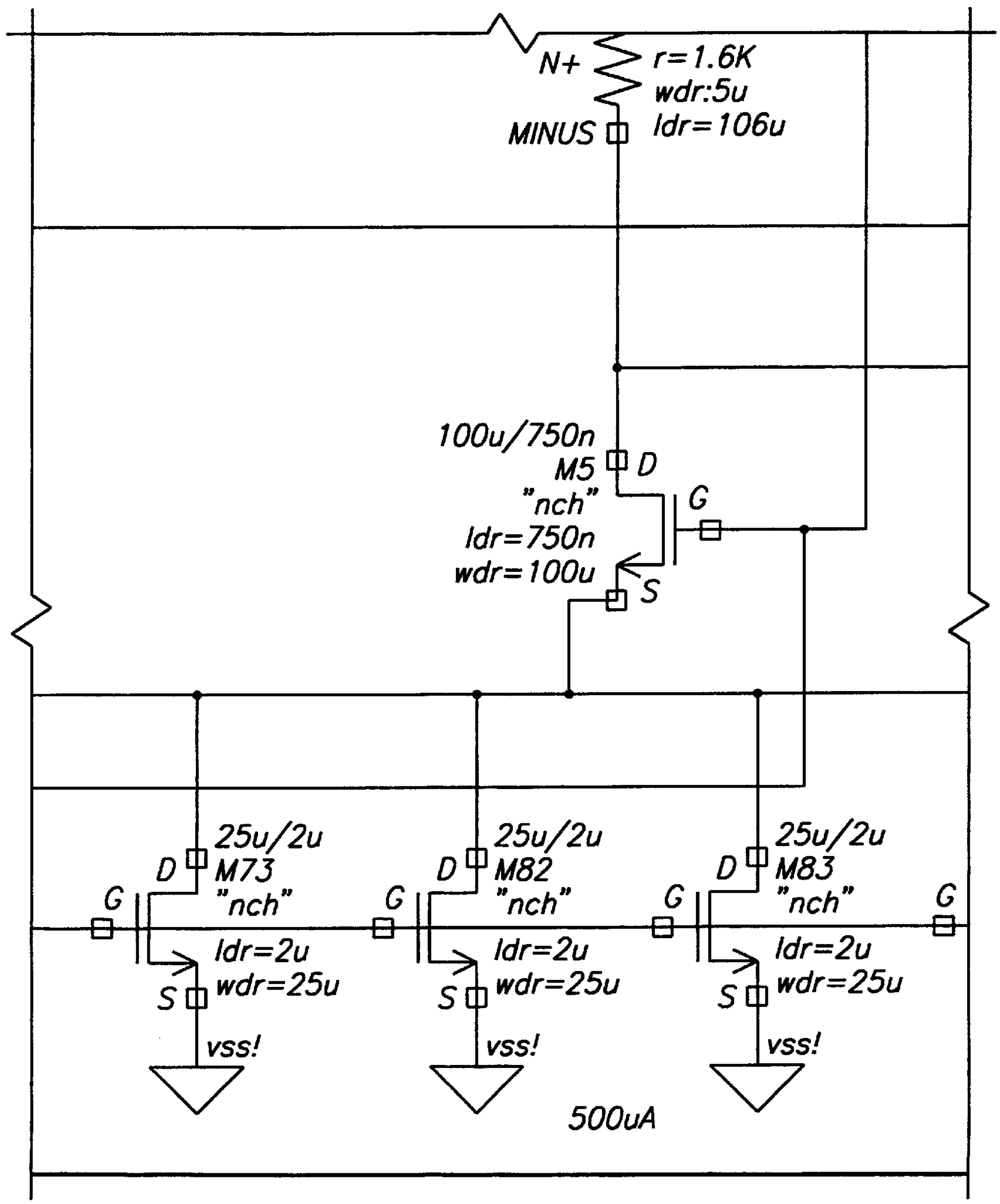
FIG 8.060502CC

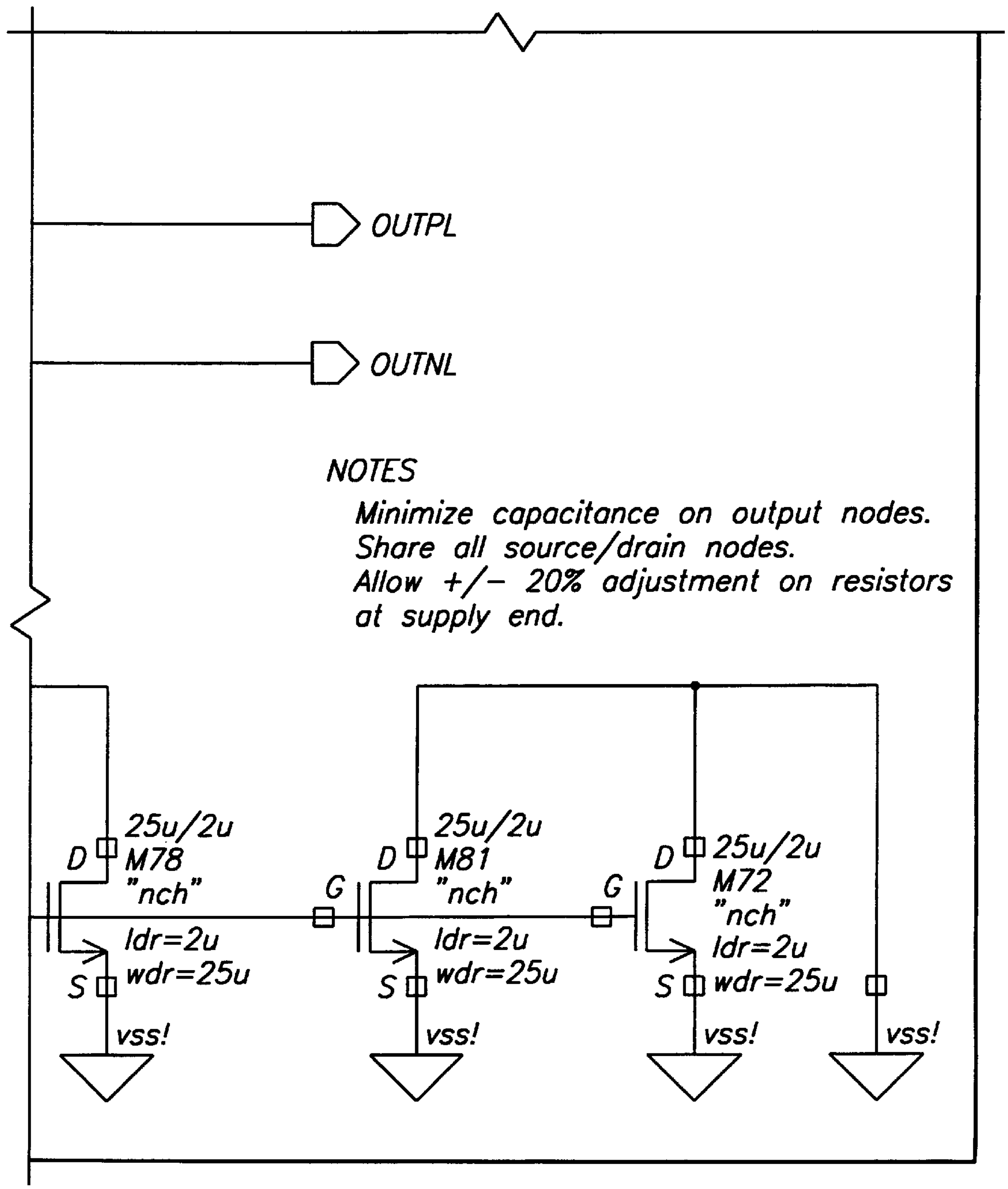
Fig 8.060502CD

| | | | | |
|---|---|---|---|---|
| 8.060503AA | 8.060503AB | 8.060503AC | 8.060503AD | 8.060503AE |
| 8.060503BA | 8.060503BB | 8.060503BC | 8.060503BD | 8.060503BE |
| 8.060503CA | 8.060503CB | 8.060503CC | 8.060503CD | 8.060503CE |
| 8.060503DA | 8.060503DB | 8.060503DC | 8.060503DD | 8.060503DE |
| 8.060503EA | 8.060503EB | 8.060503EC | 8.060503ED | 8.060503EE |
| 8.060503FA | 8.060503FB | 8.060503FC | 8.060503FD | 8.060503FE |

Fig 8.060503

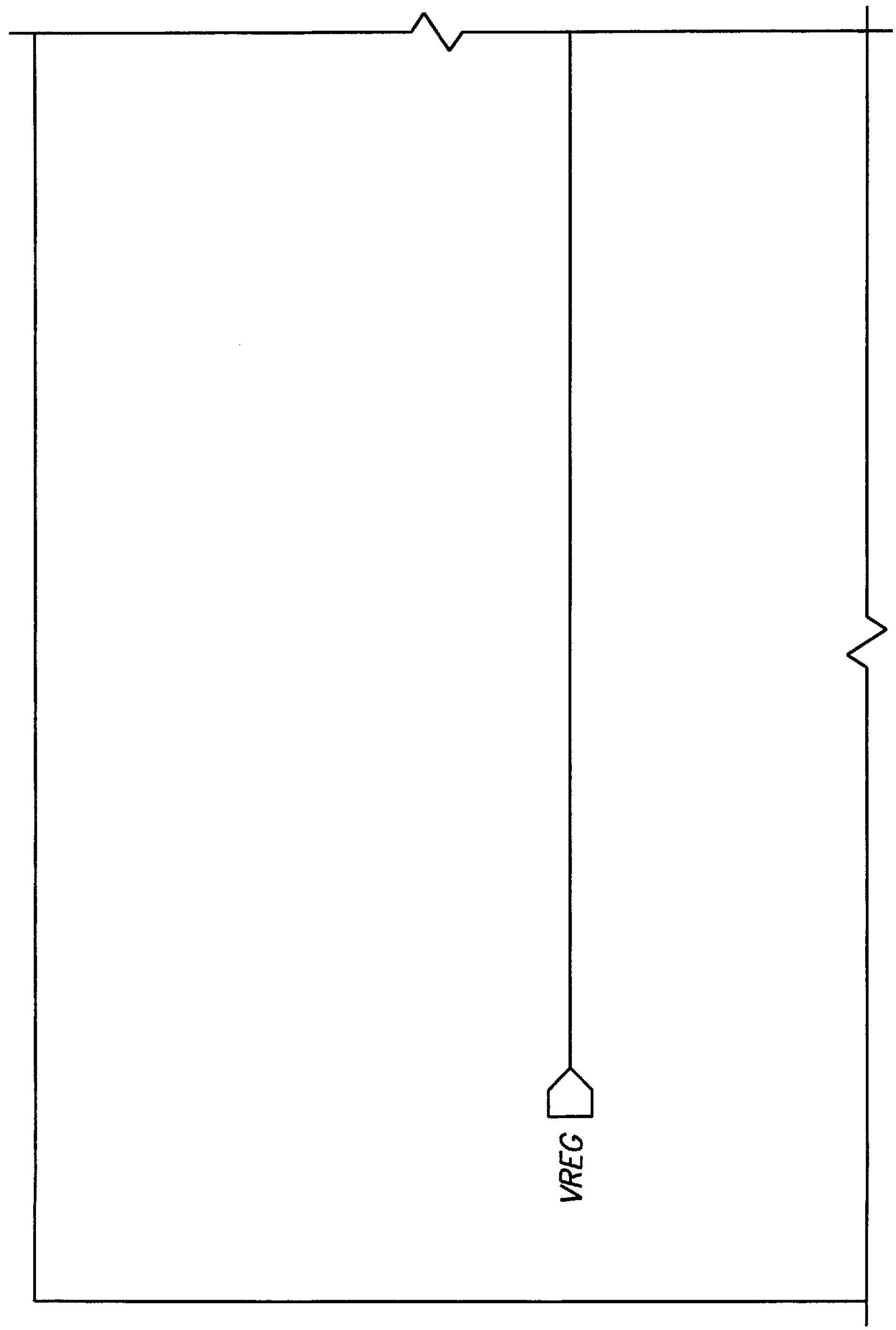
Fig. 8.060503AA

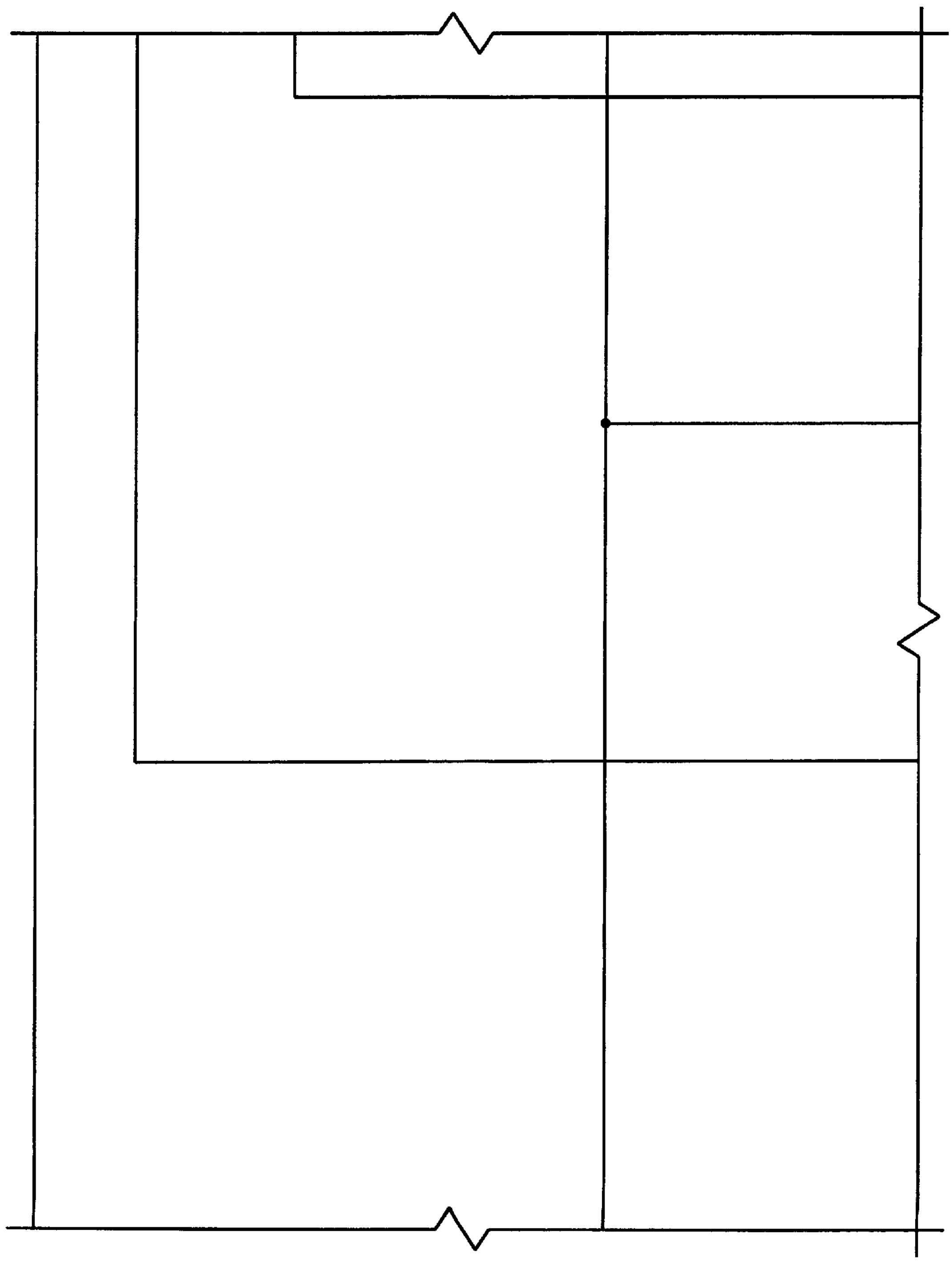
FIG 8.060503AB

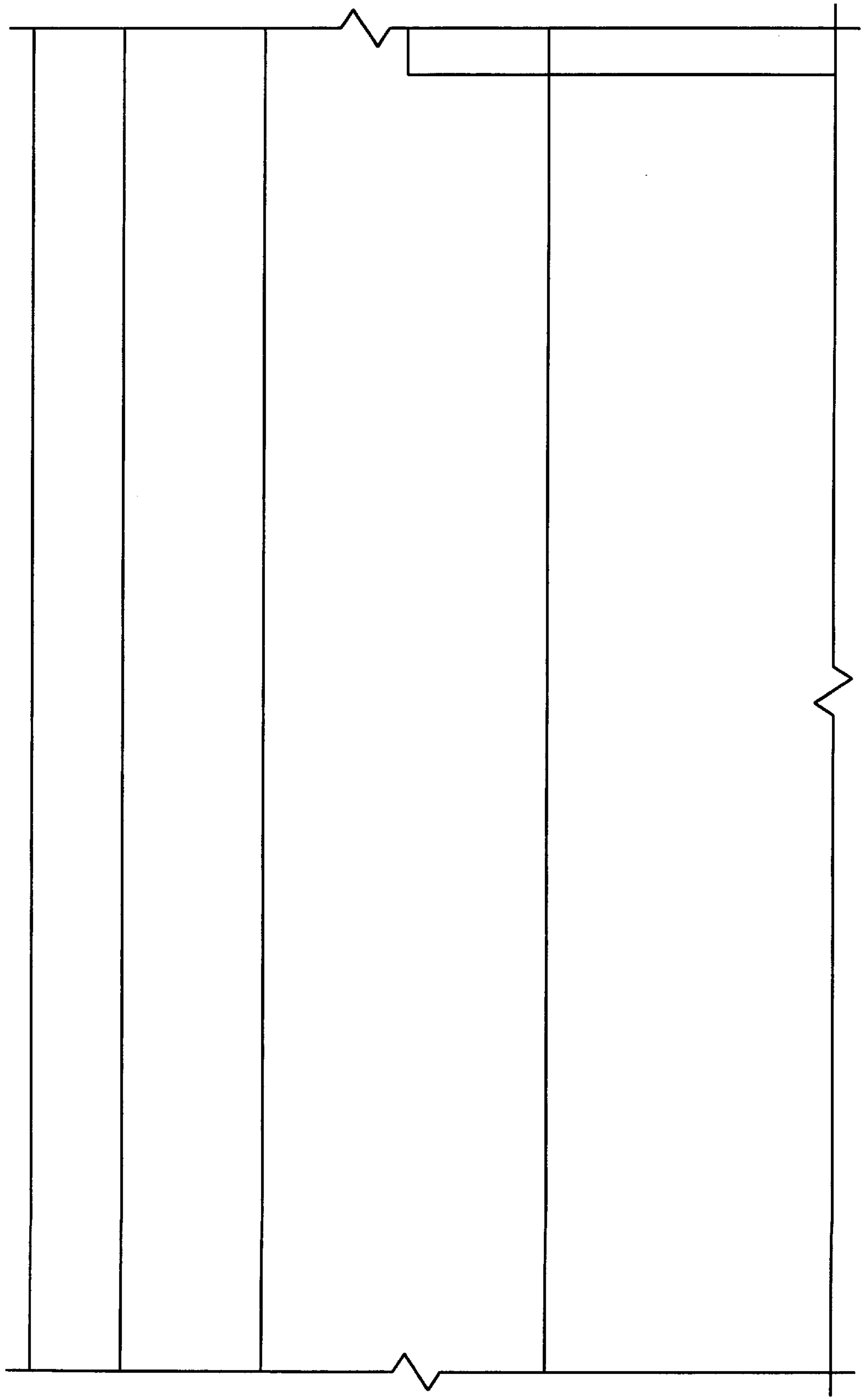
FIG. 8.0060503AAC

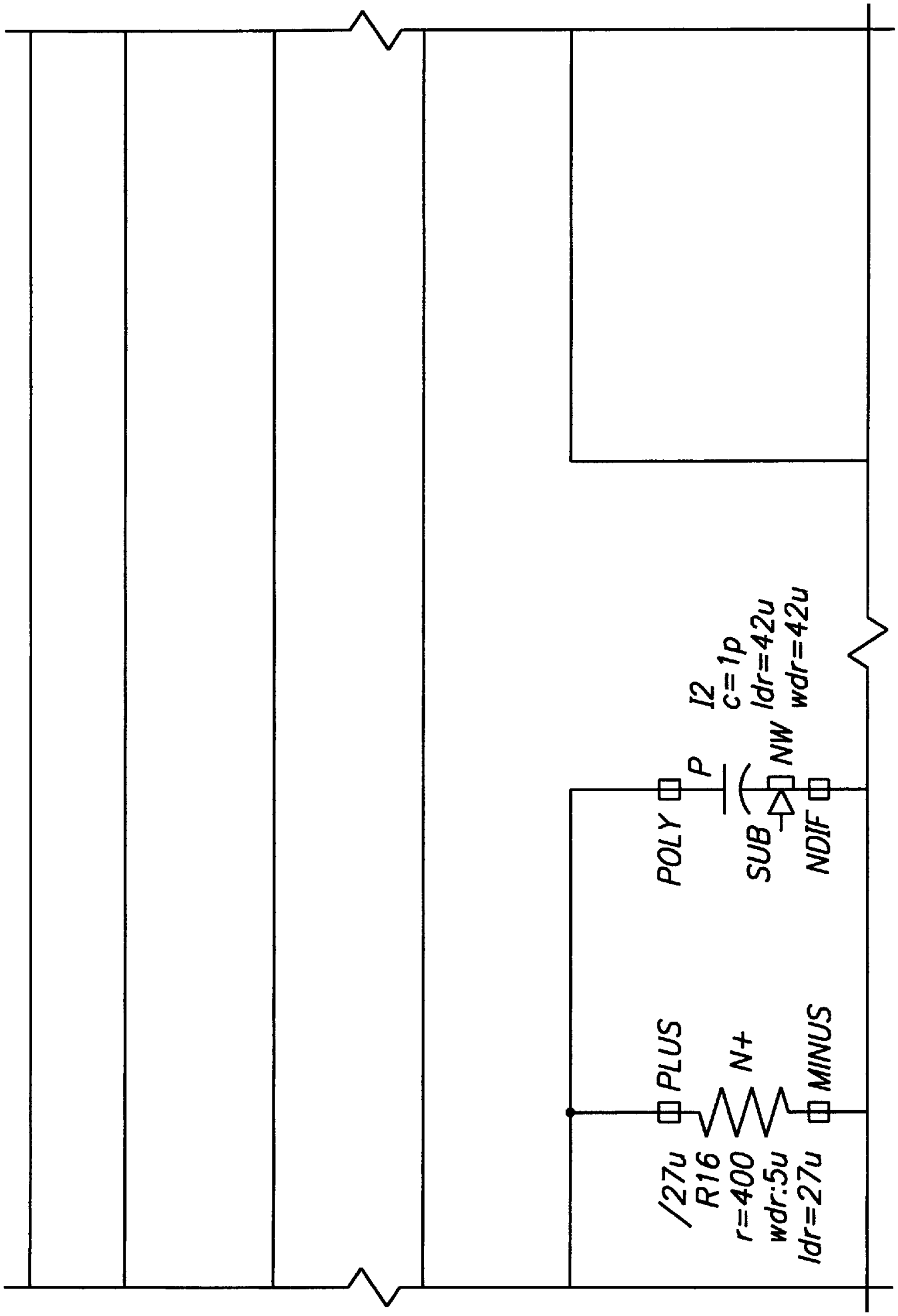
FIG. 8.060503AD

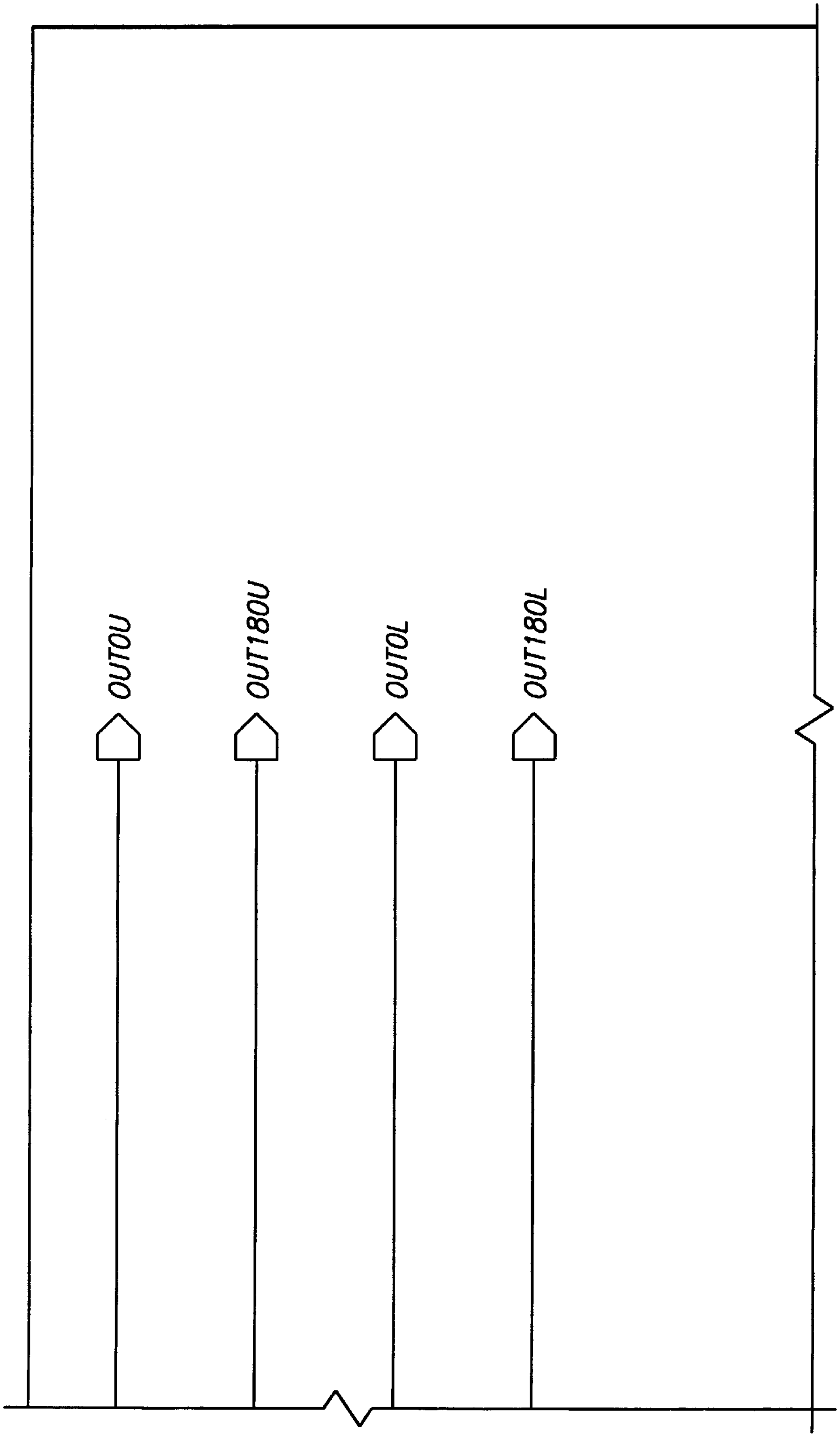
FIG. 8.060503AE

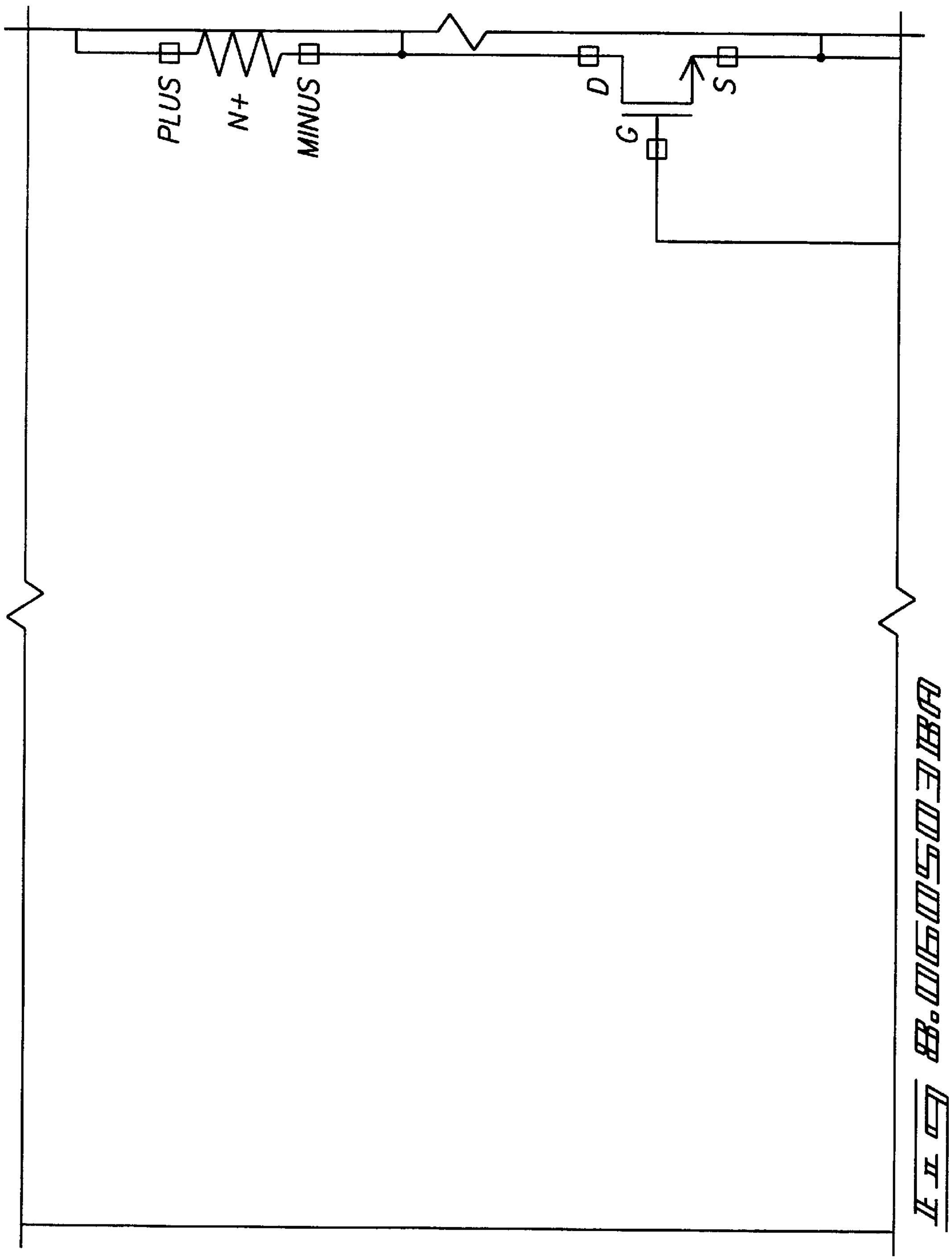
FIG. 8.060503BA

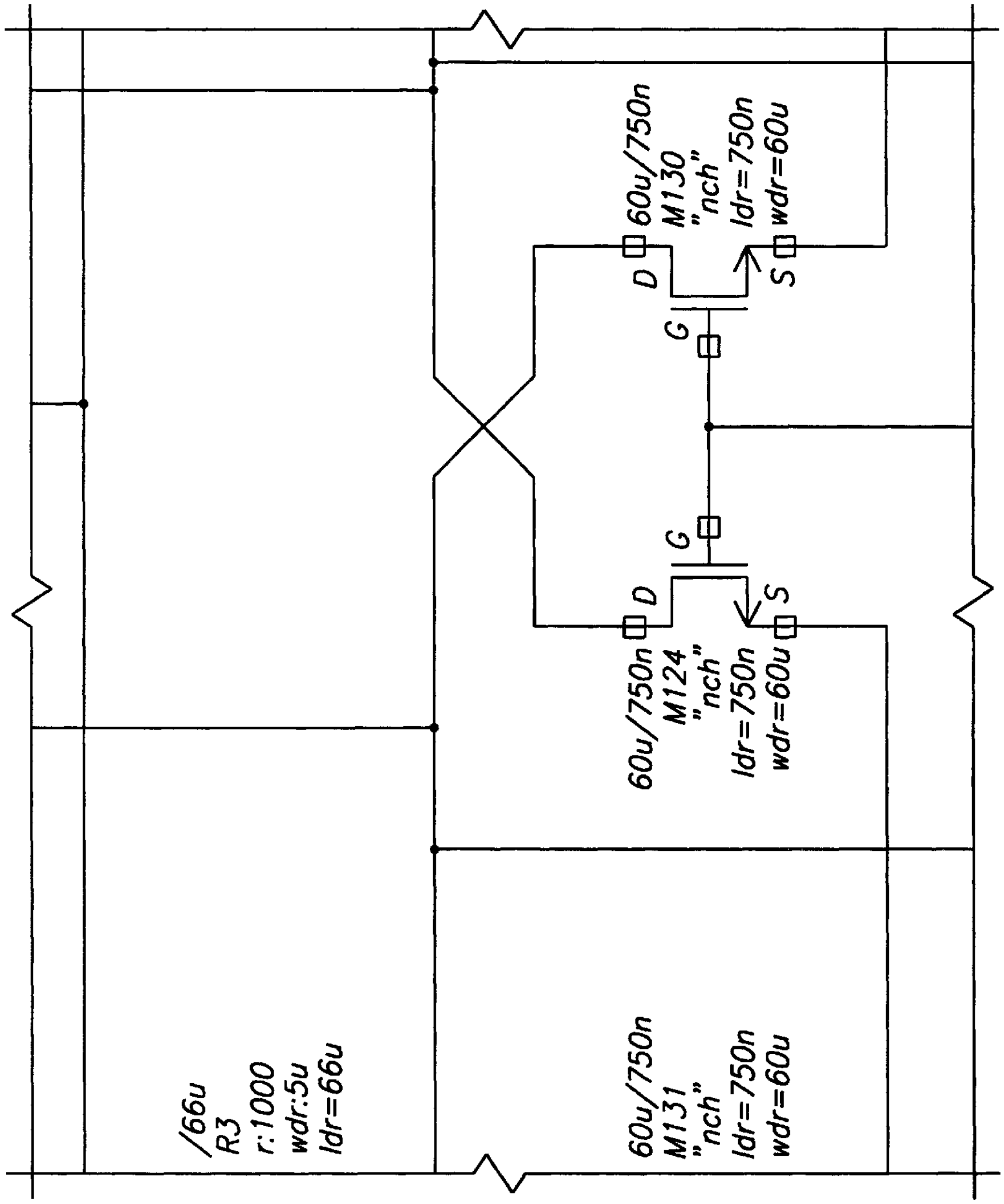
FIG. 8.005038B

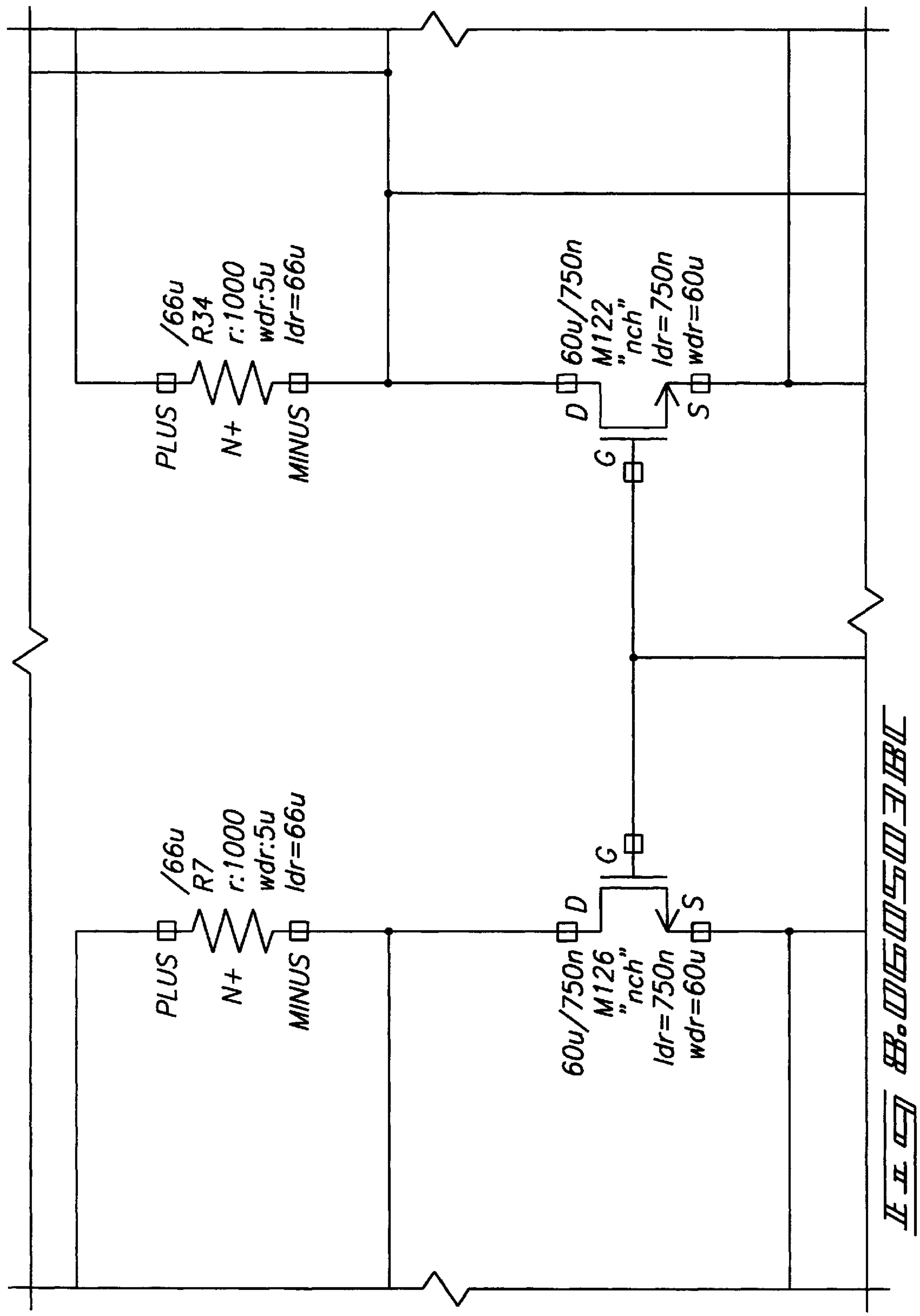
FIG. 8.006503BE

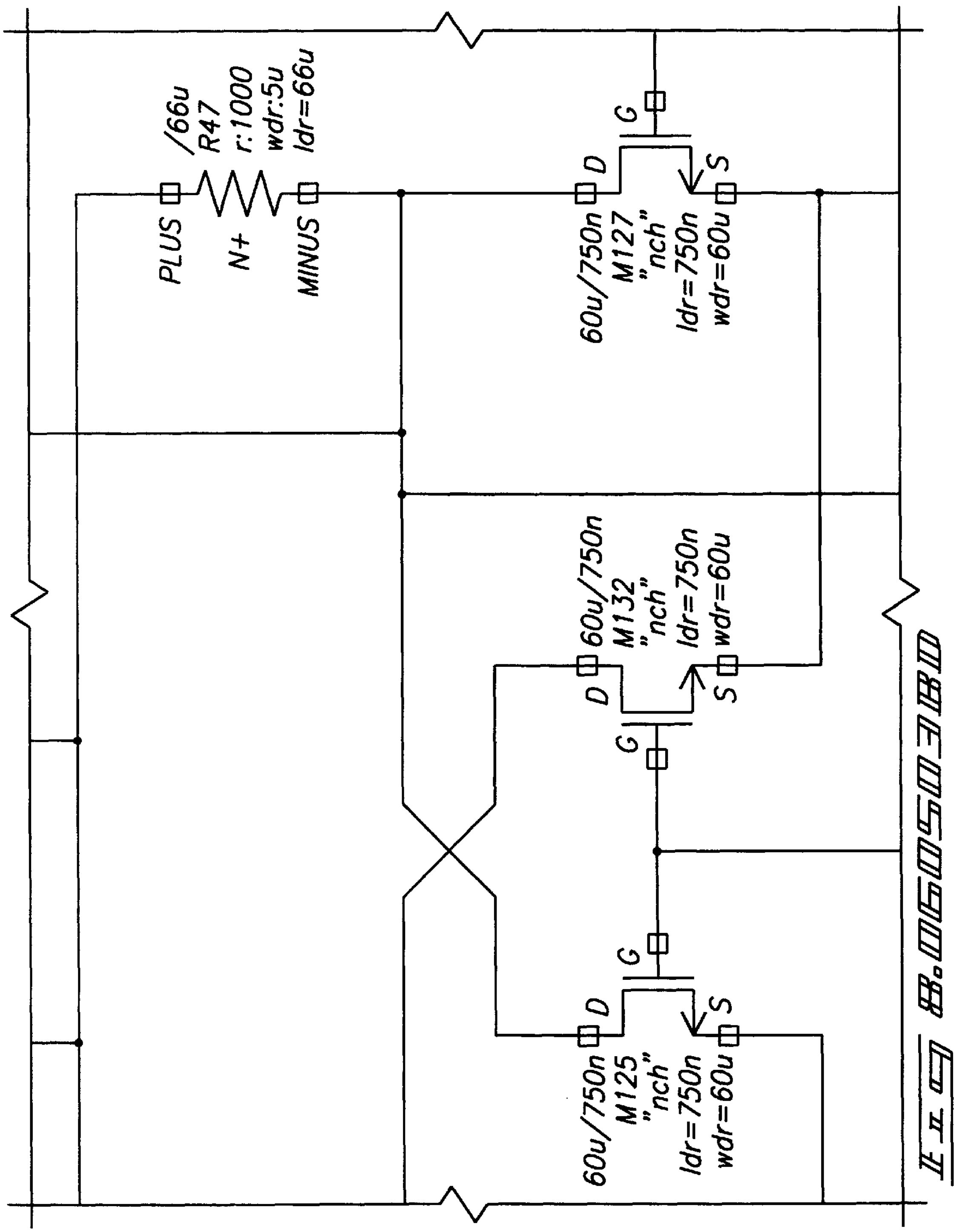
FIG. 8.0605037BD

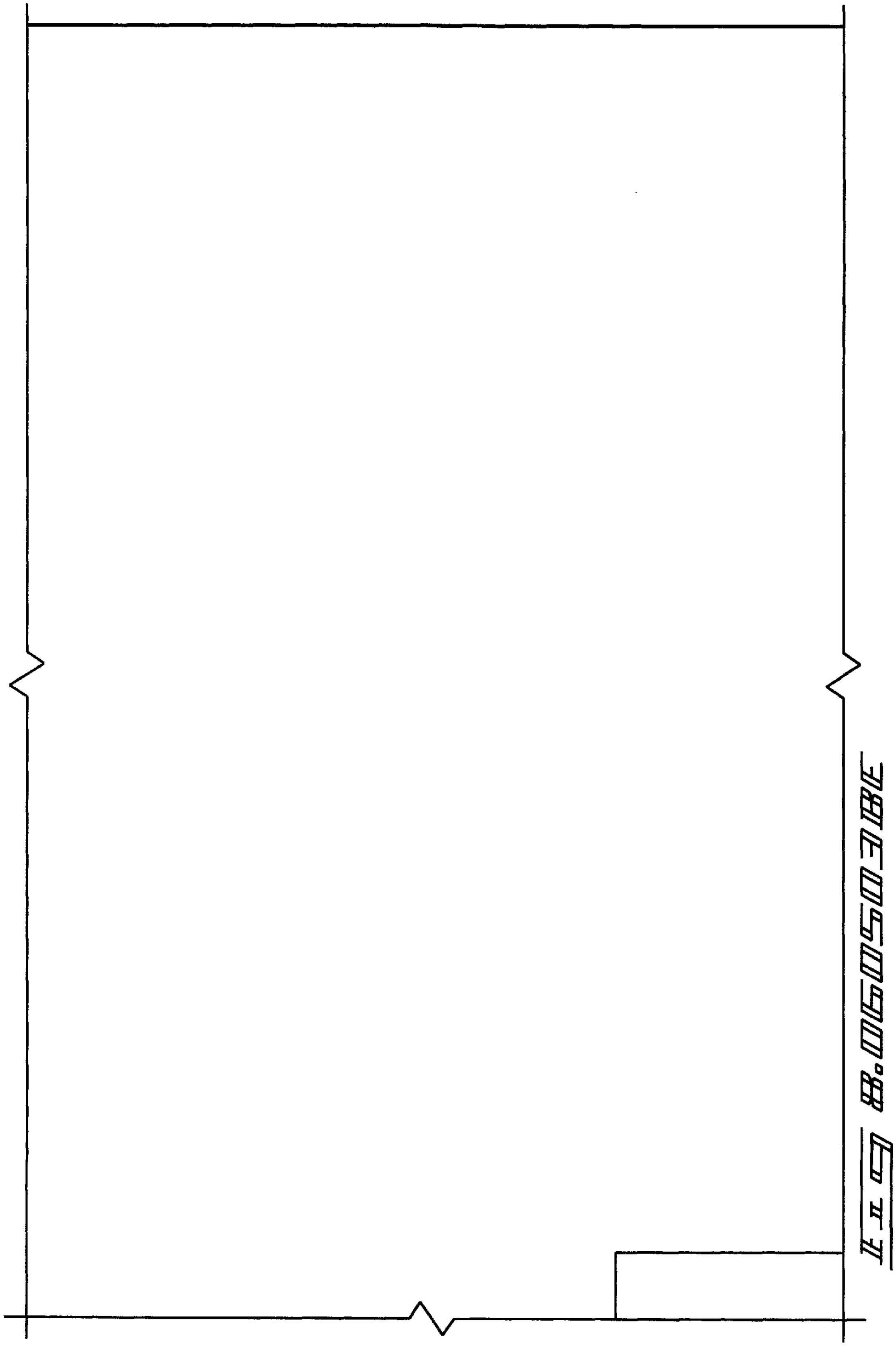
FIG. 8.060503BE

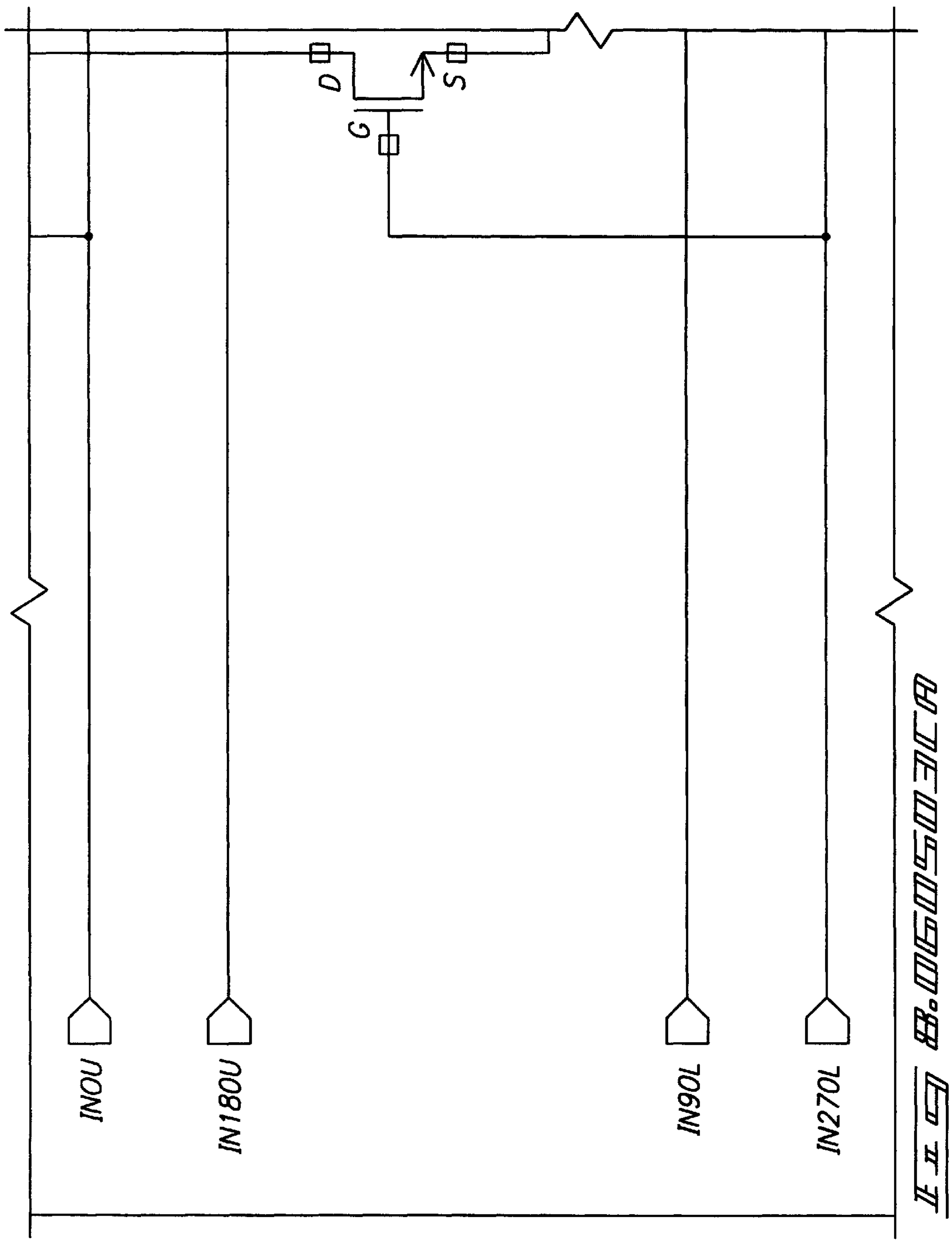
FIG. 8.060503CA

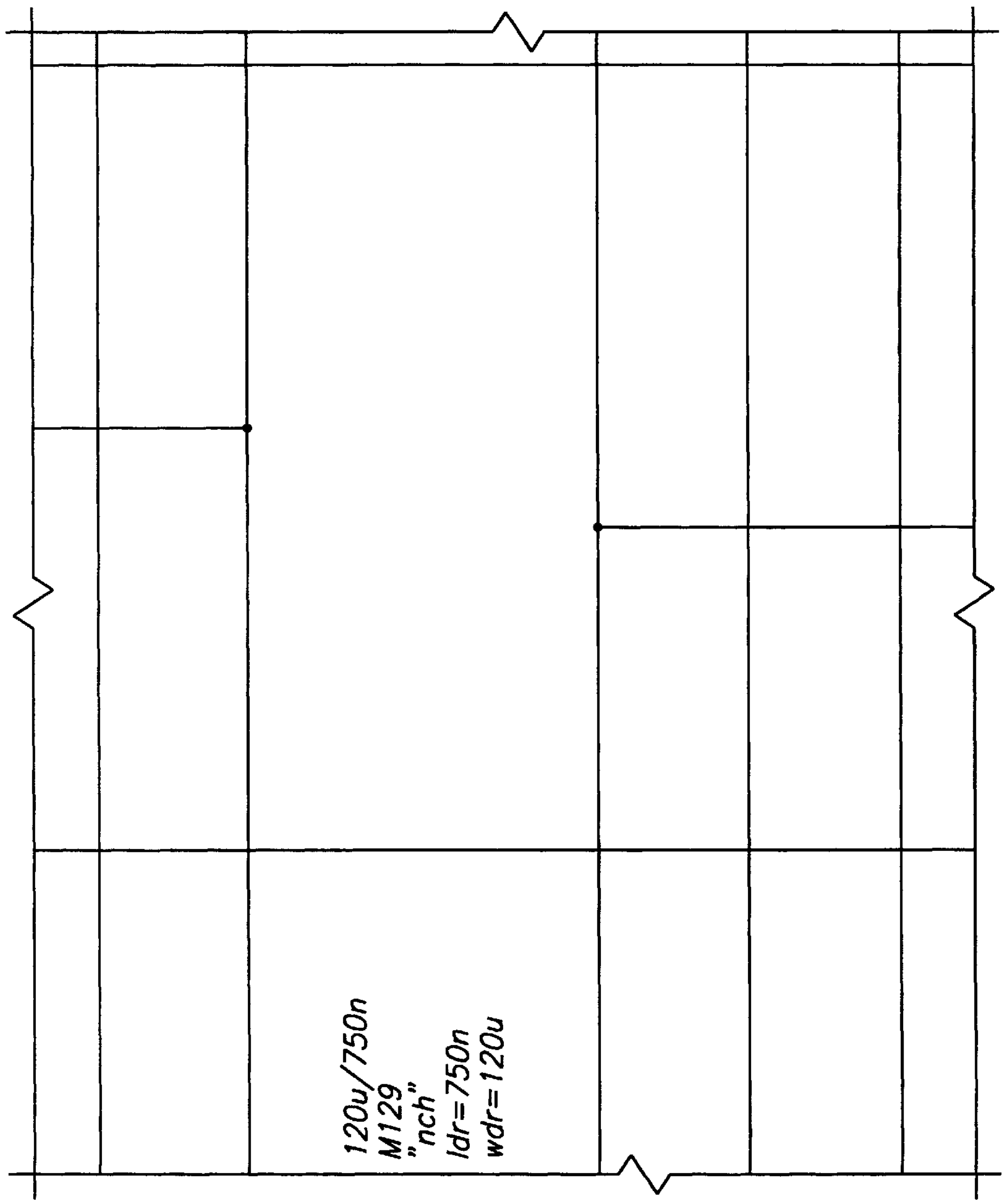
FIG 8.060503CB

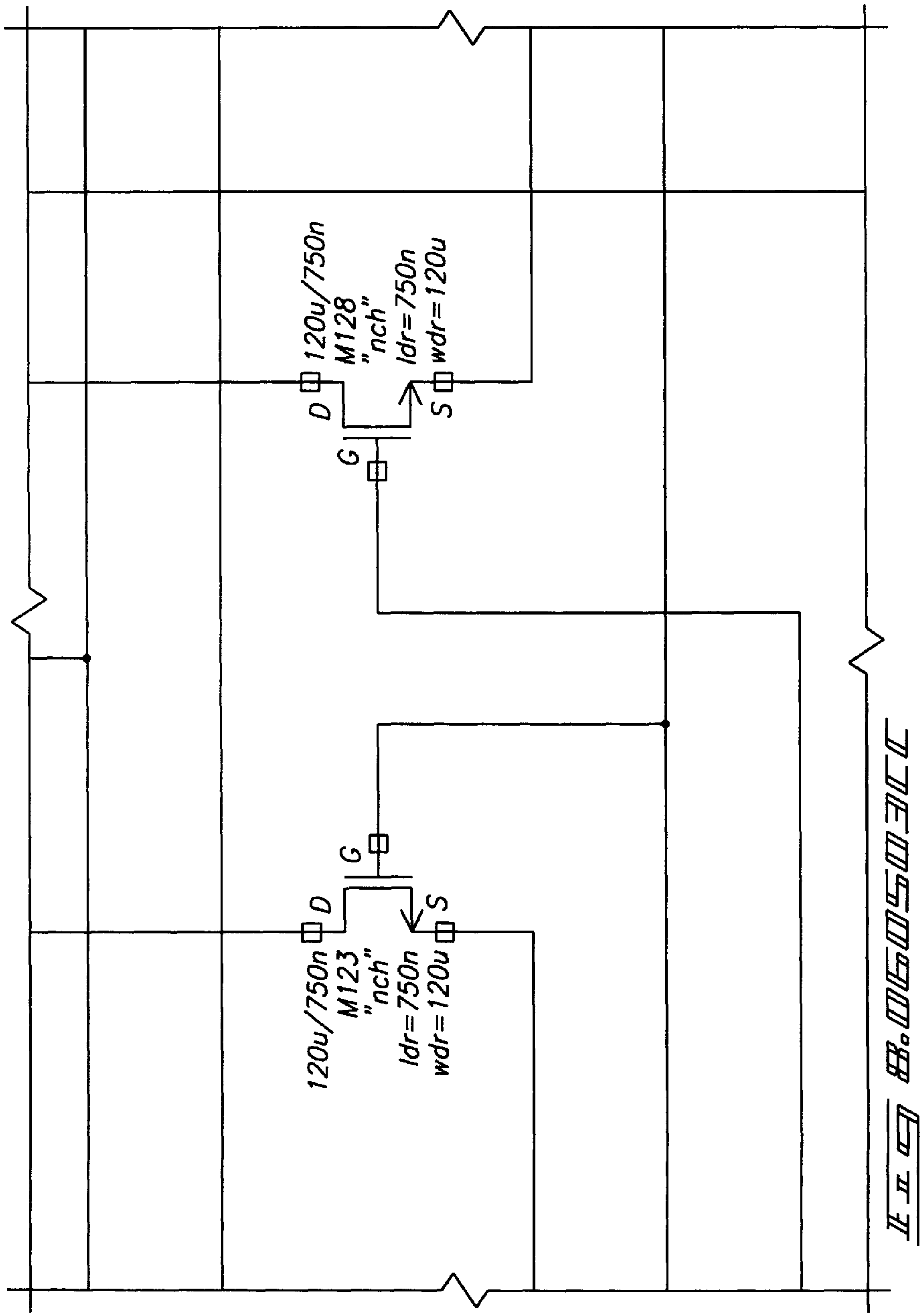
FIG. 8.060503CC

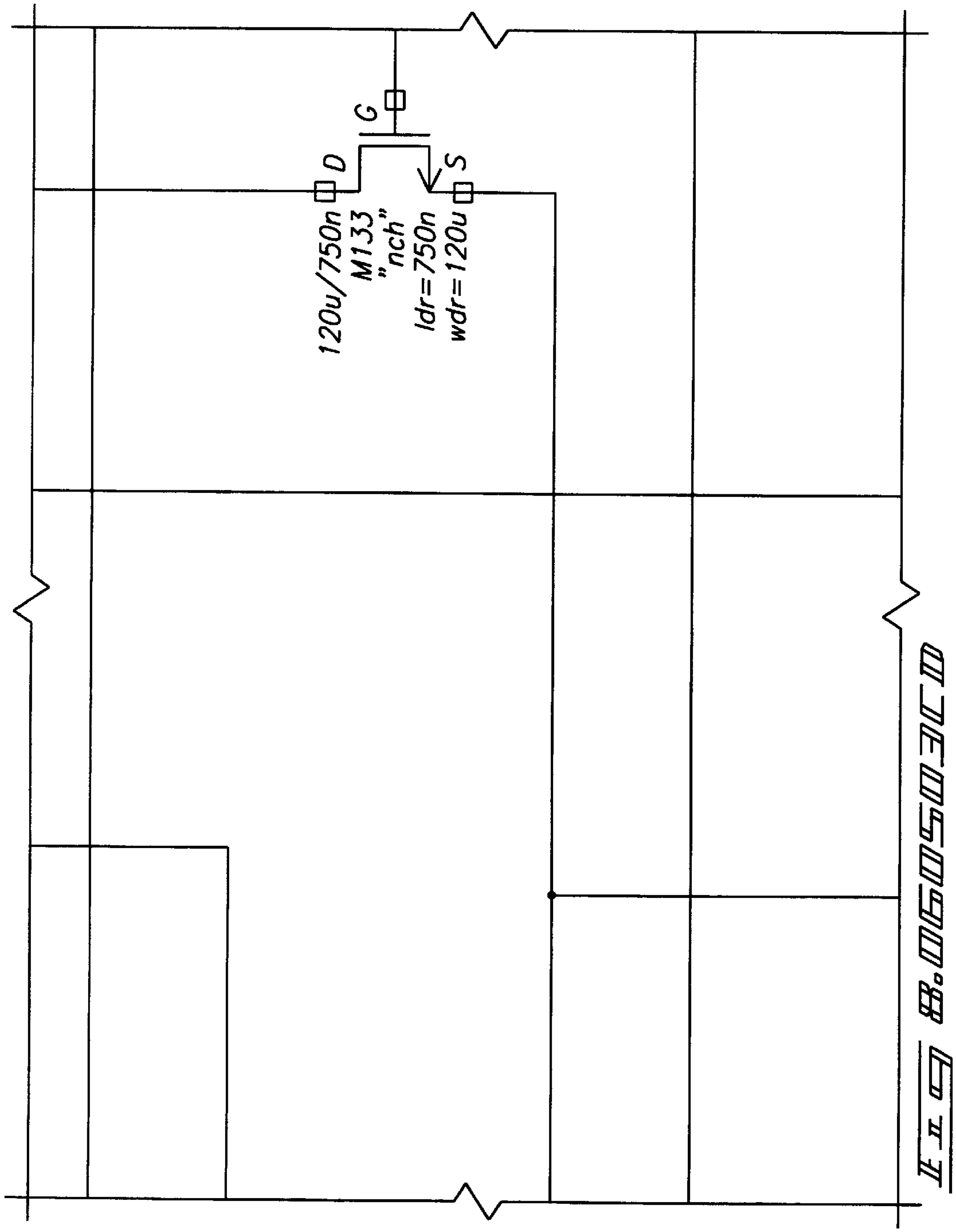
FIG. 8.060503CD

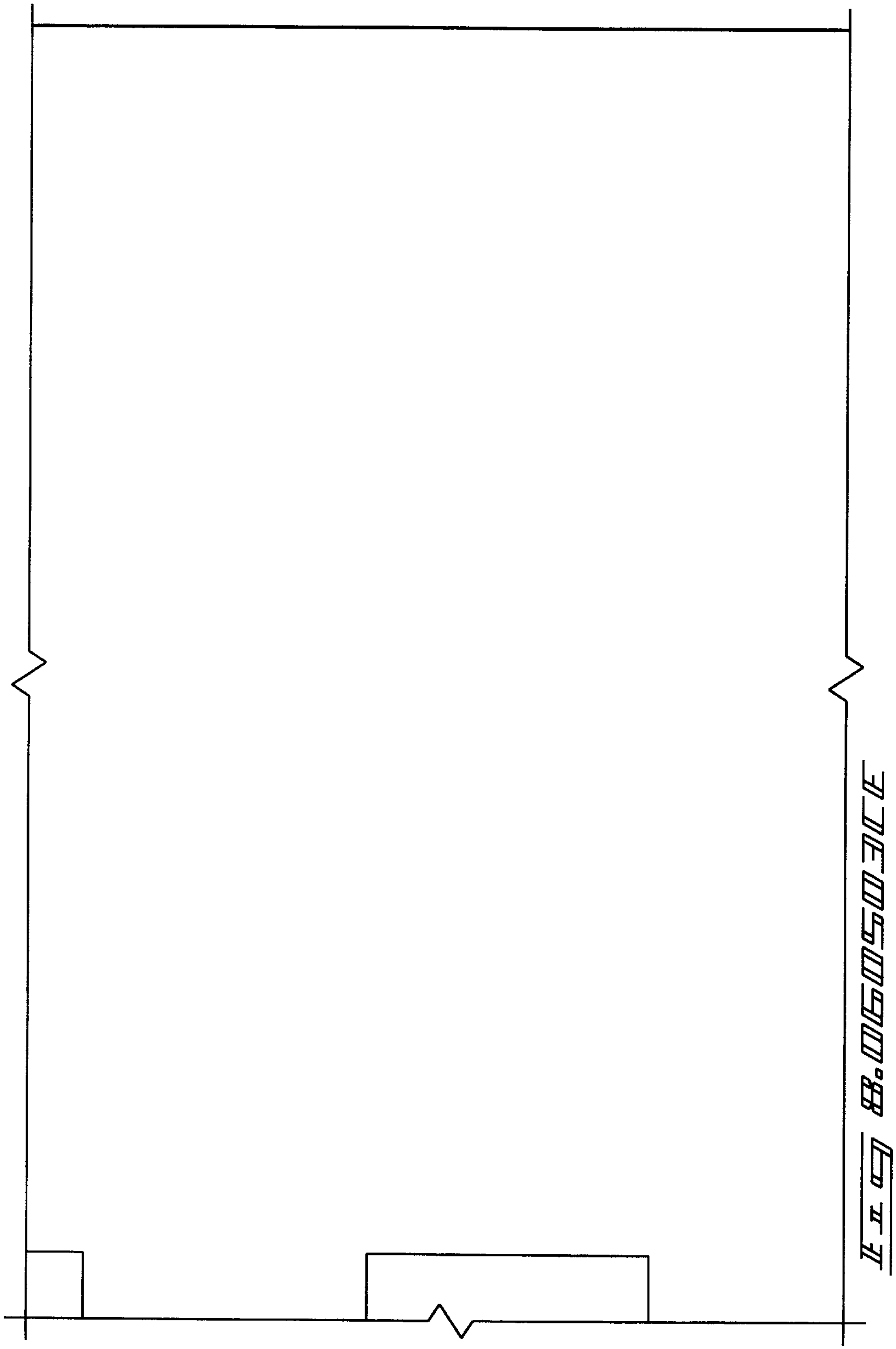
FIG. 8.060503CE

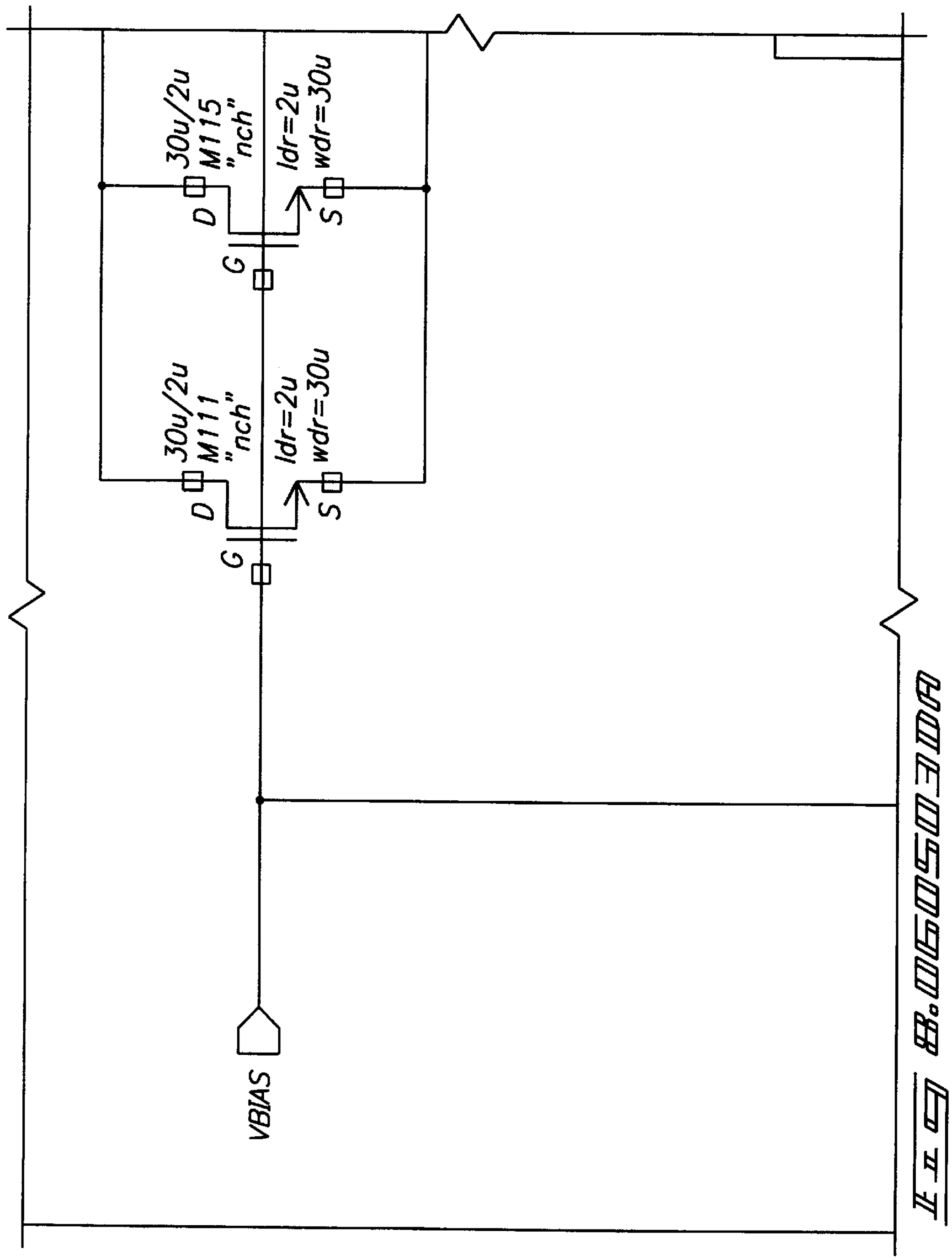
FIG. 8.090503DA

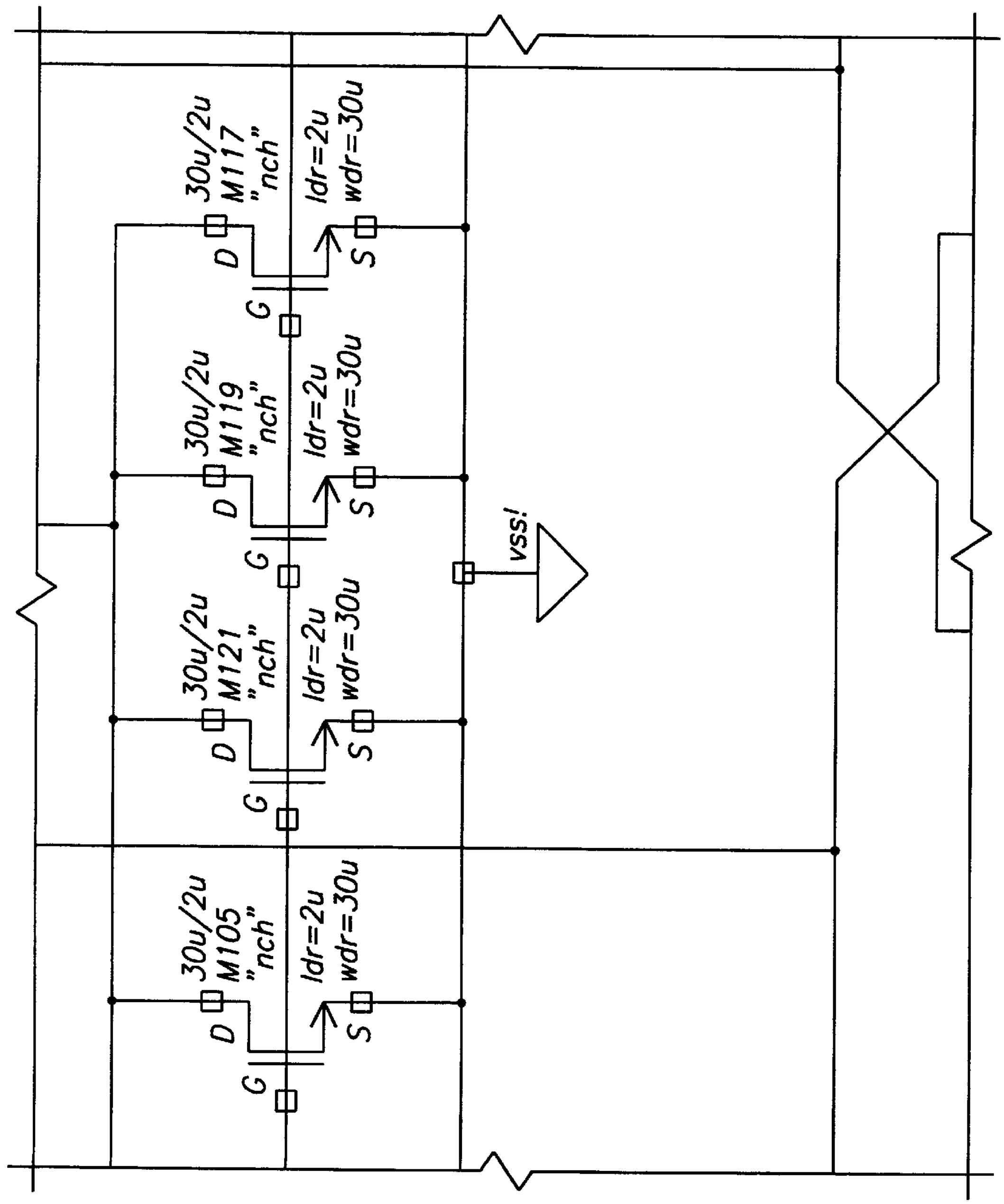
FIG. 8.0605030B

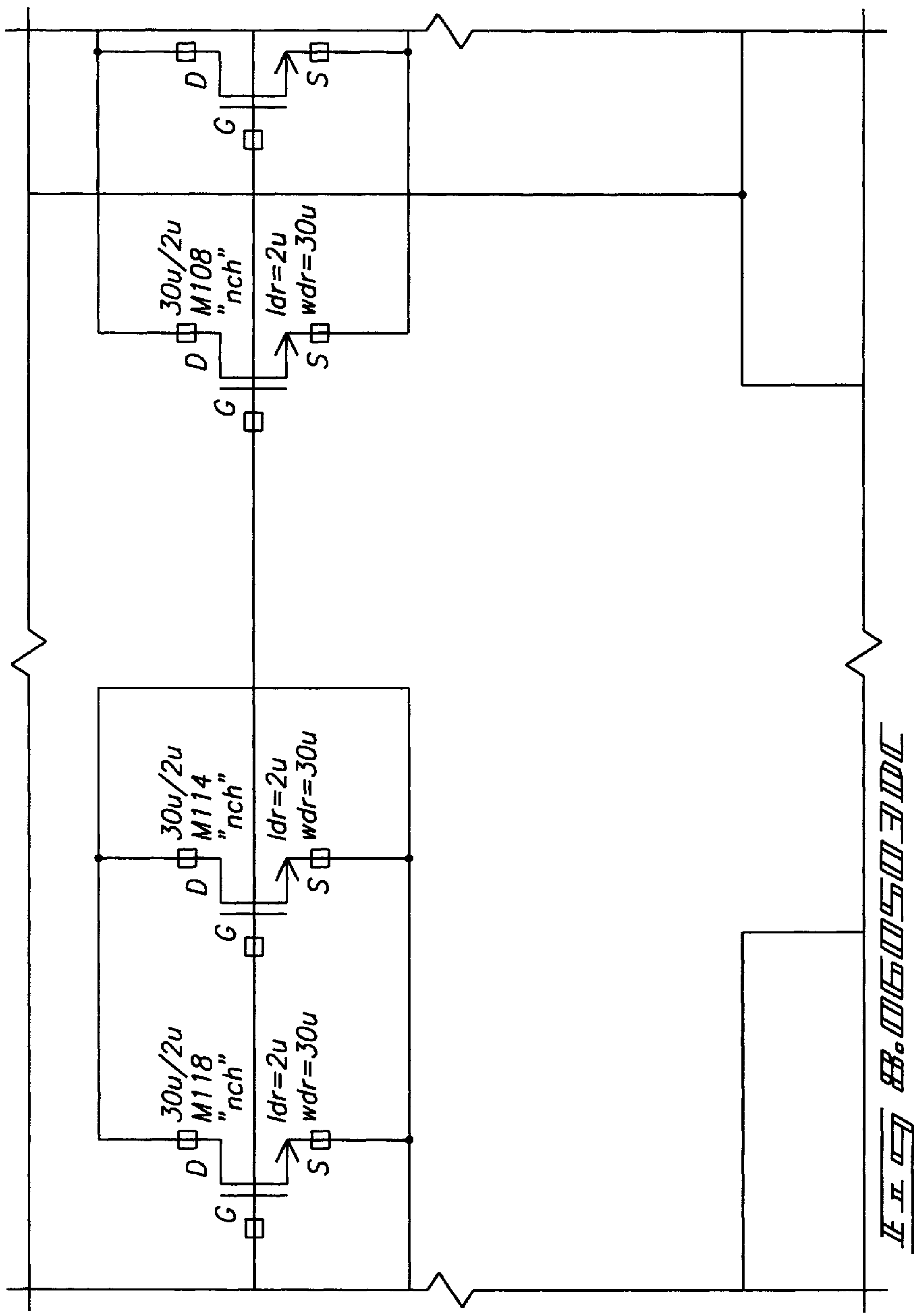
FIG. 8.0060503DC

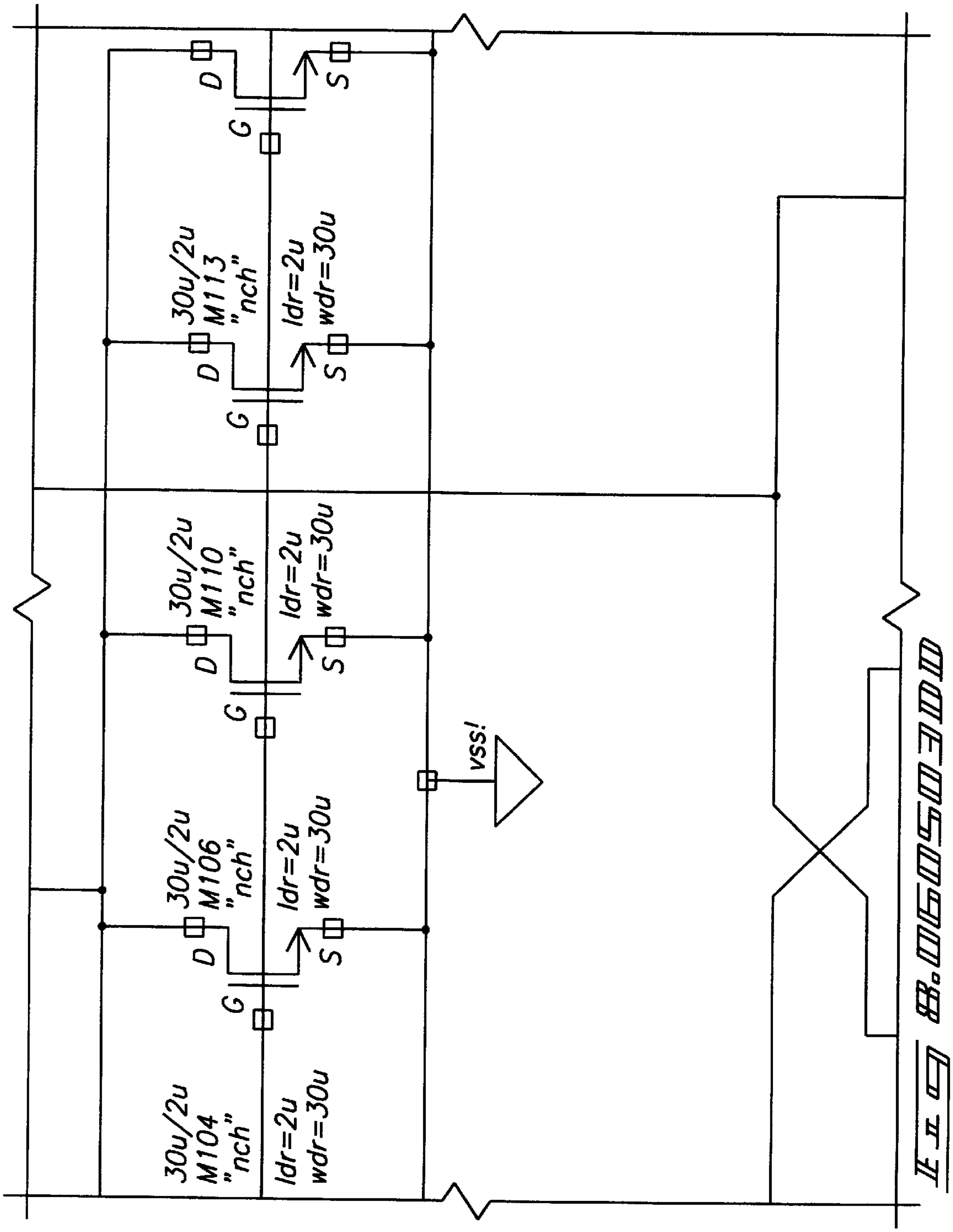
Fig 8.060503DD

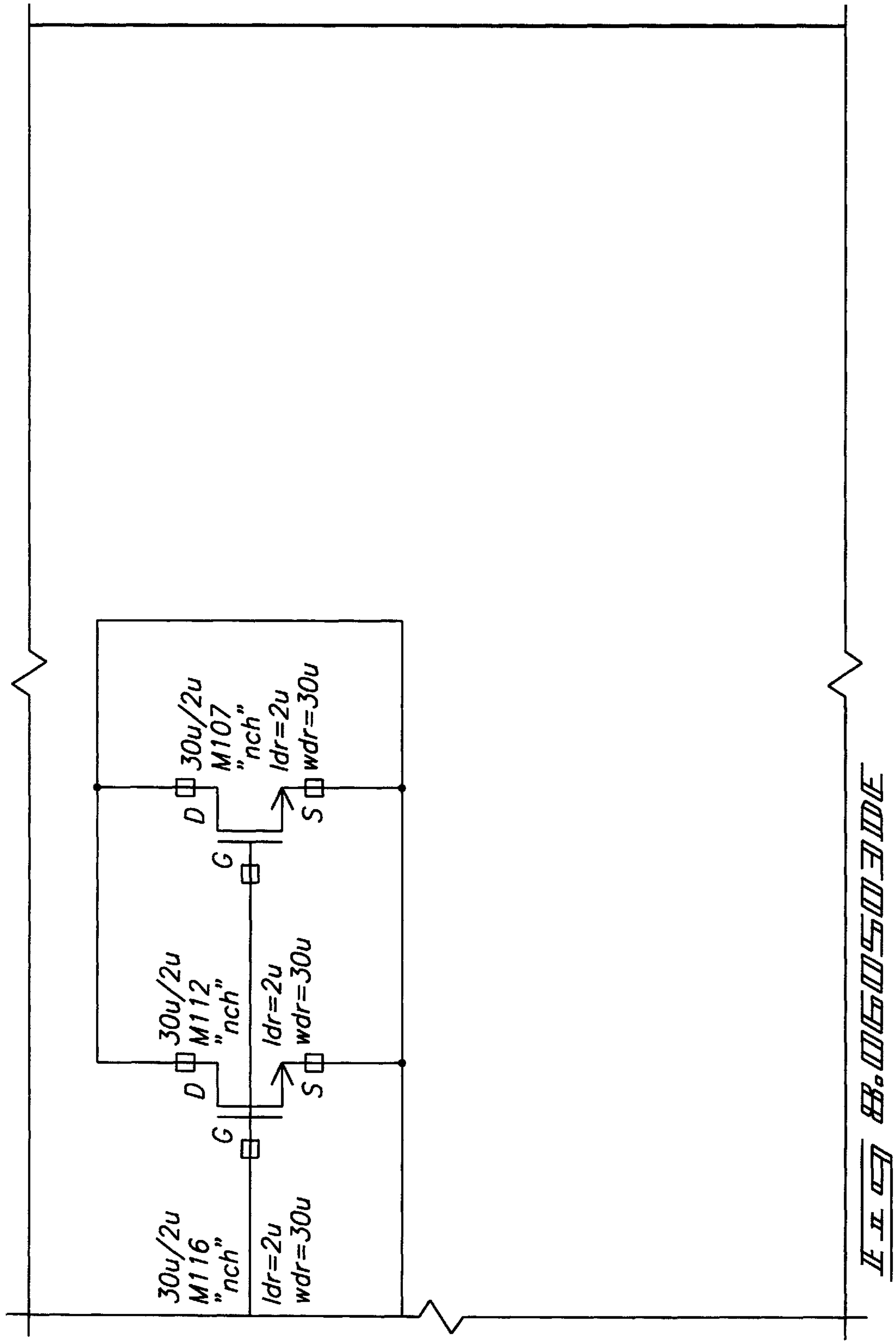
FIG. 8.006050 3DE

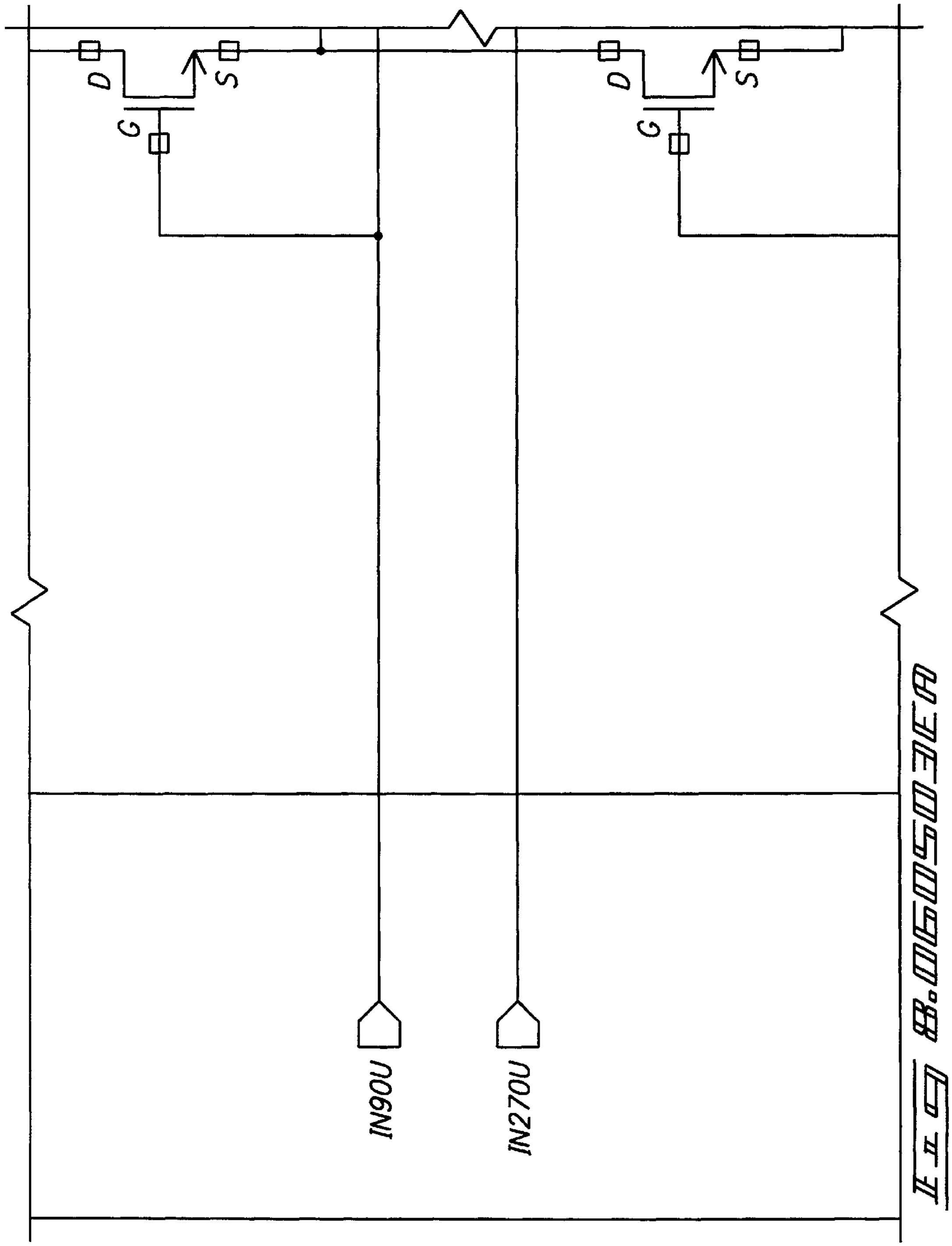
FIG. 8.006503EA

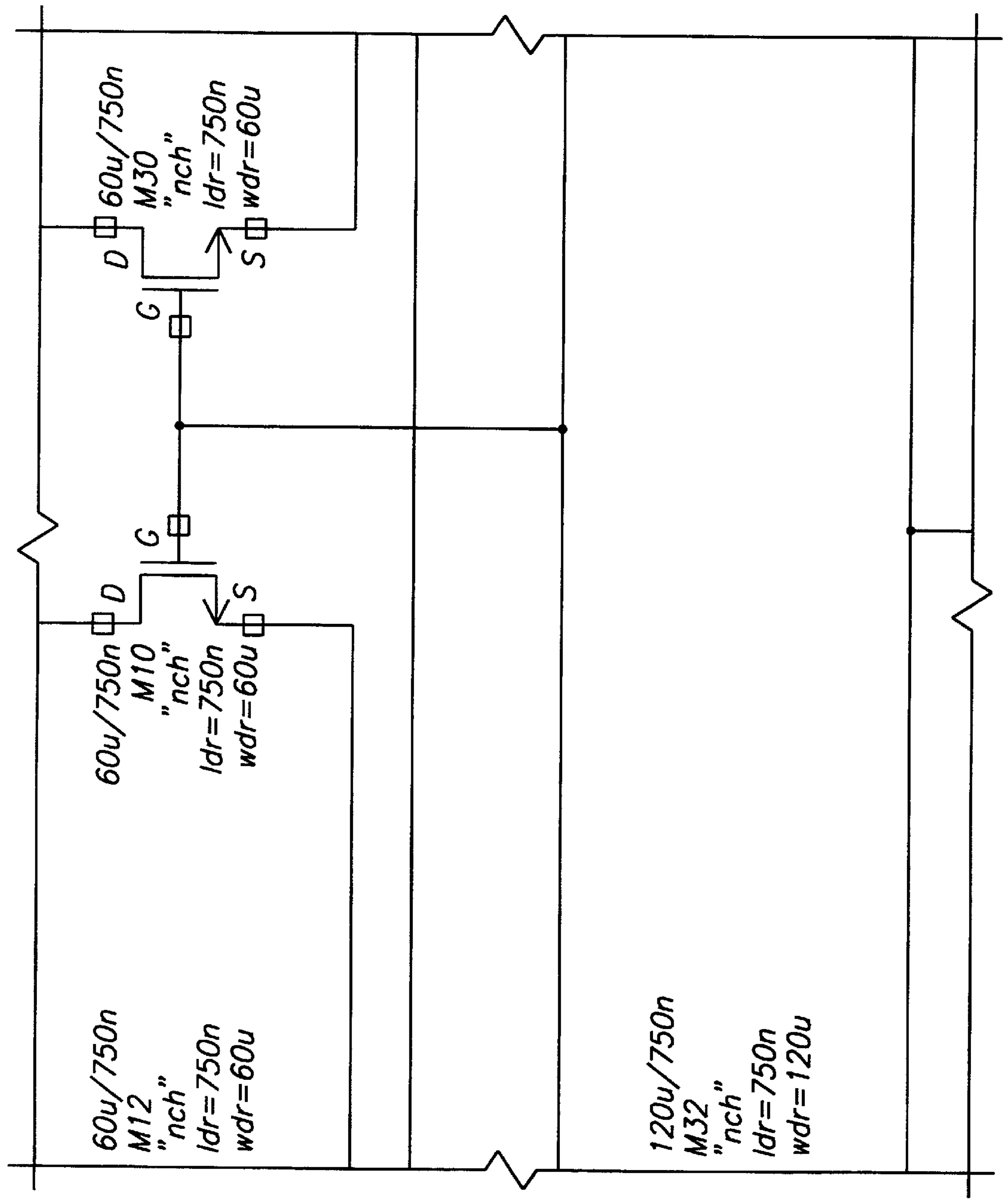
Fig 8.060503E.B

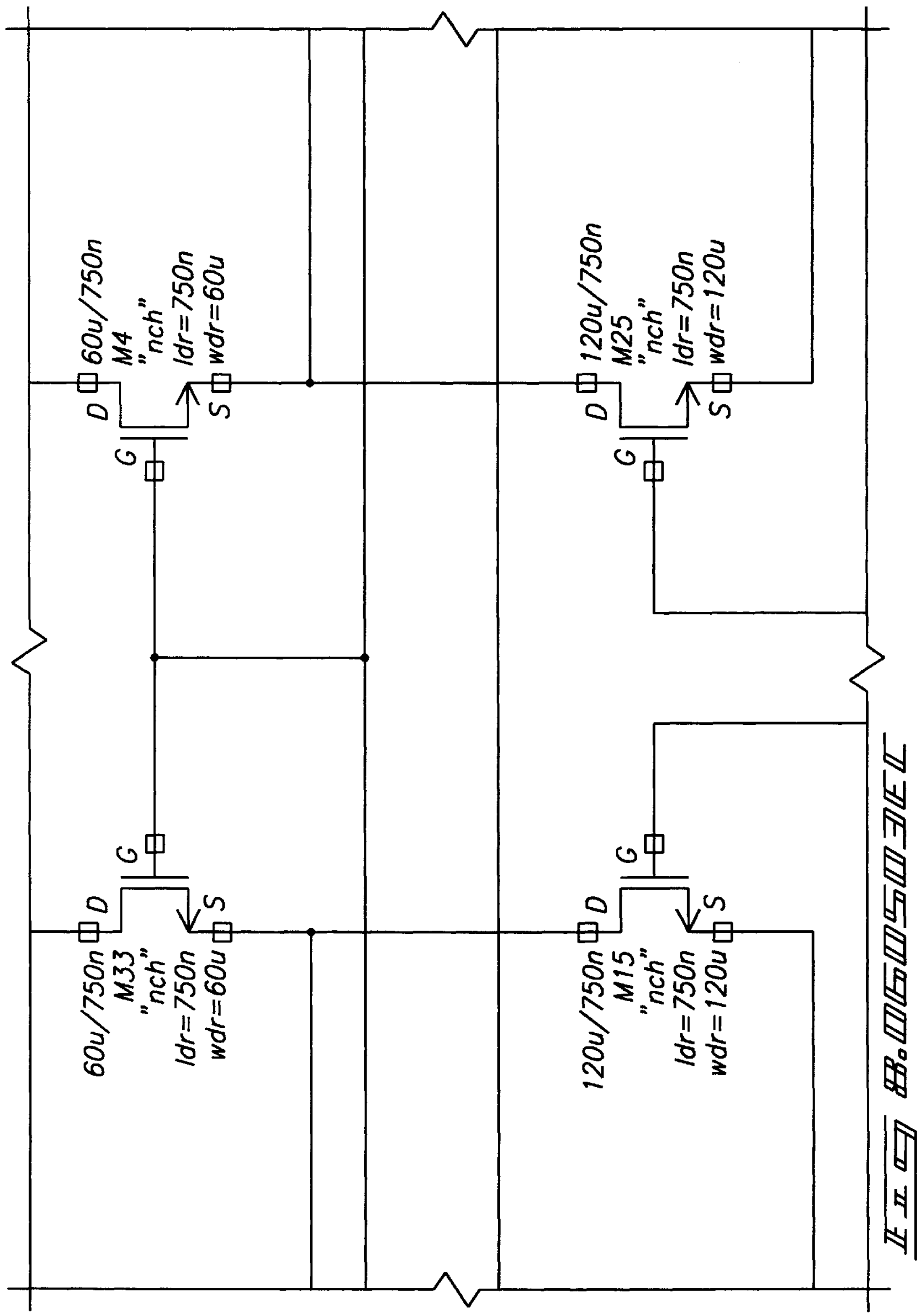
FIG. 8.06G05.3EL

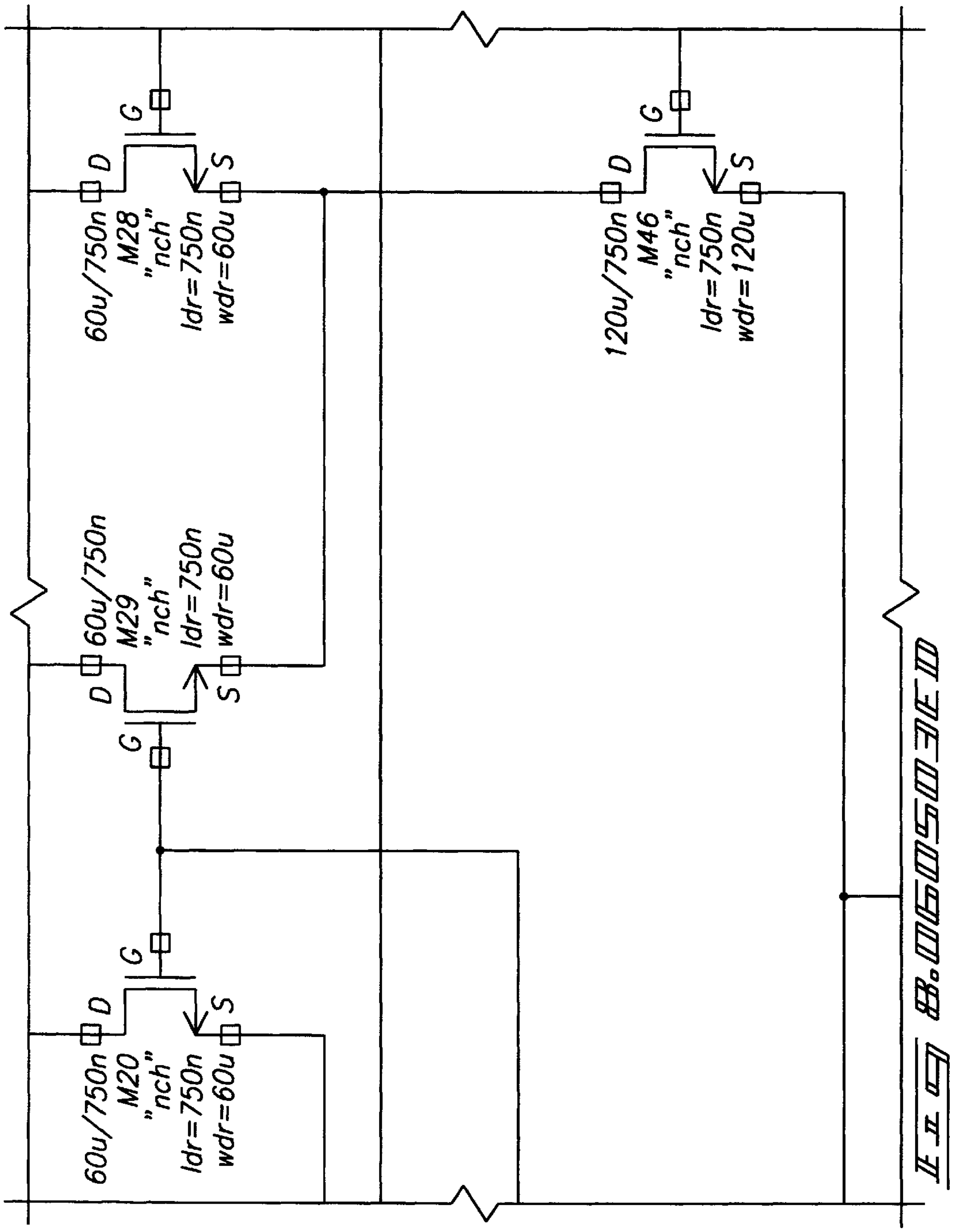
Fig. 8.006053ED

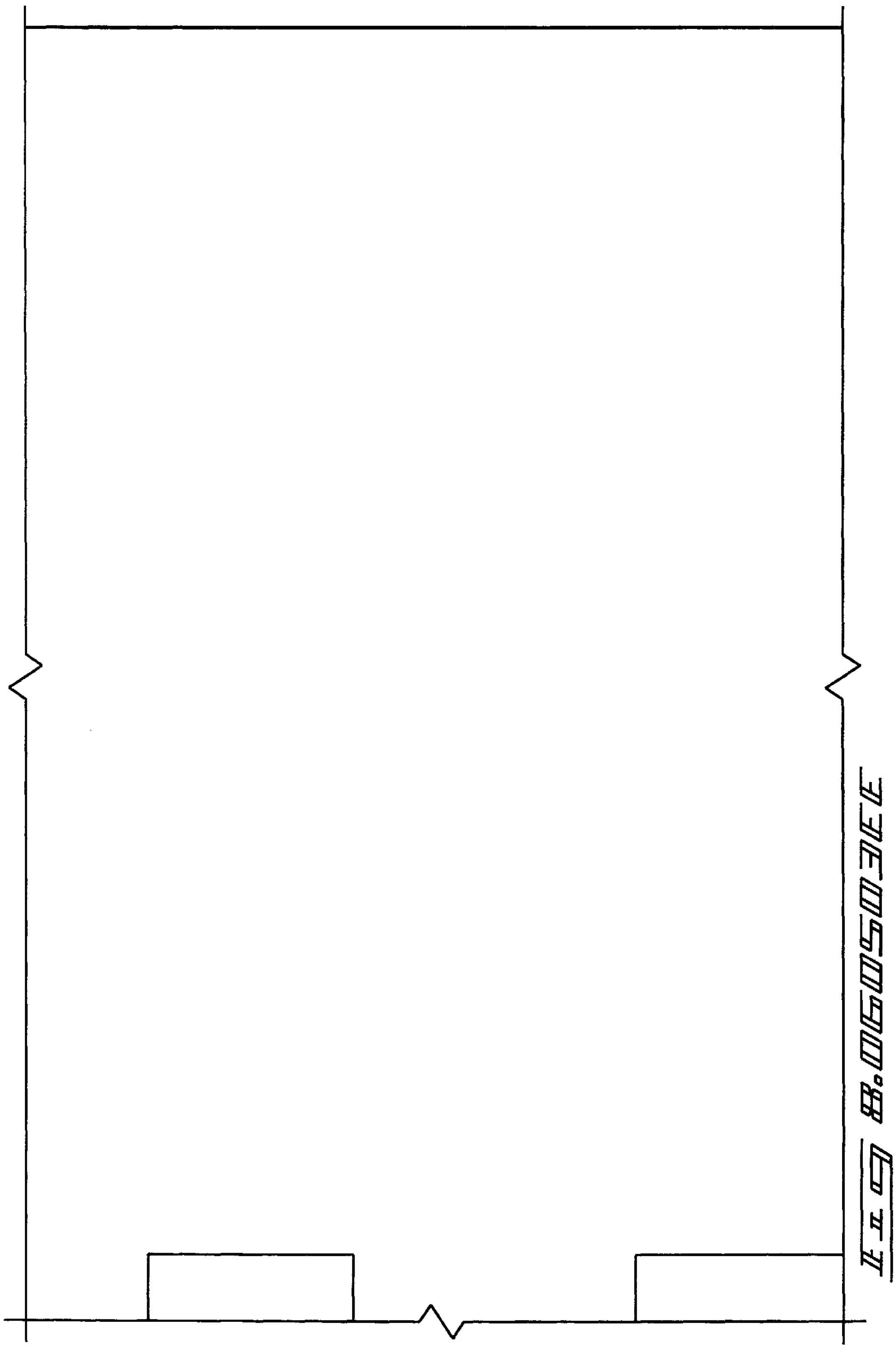
FIG. 8.060503E

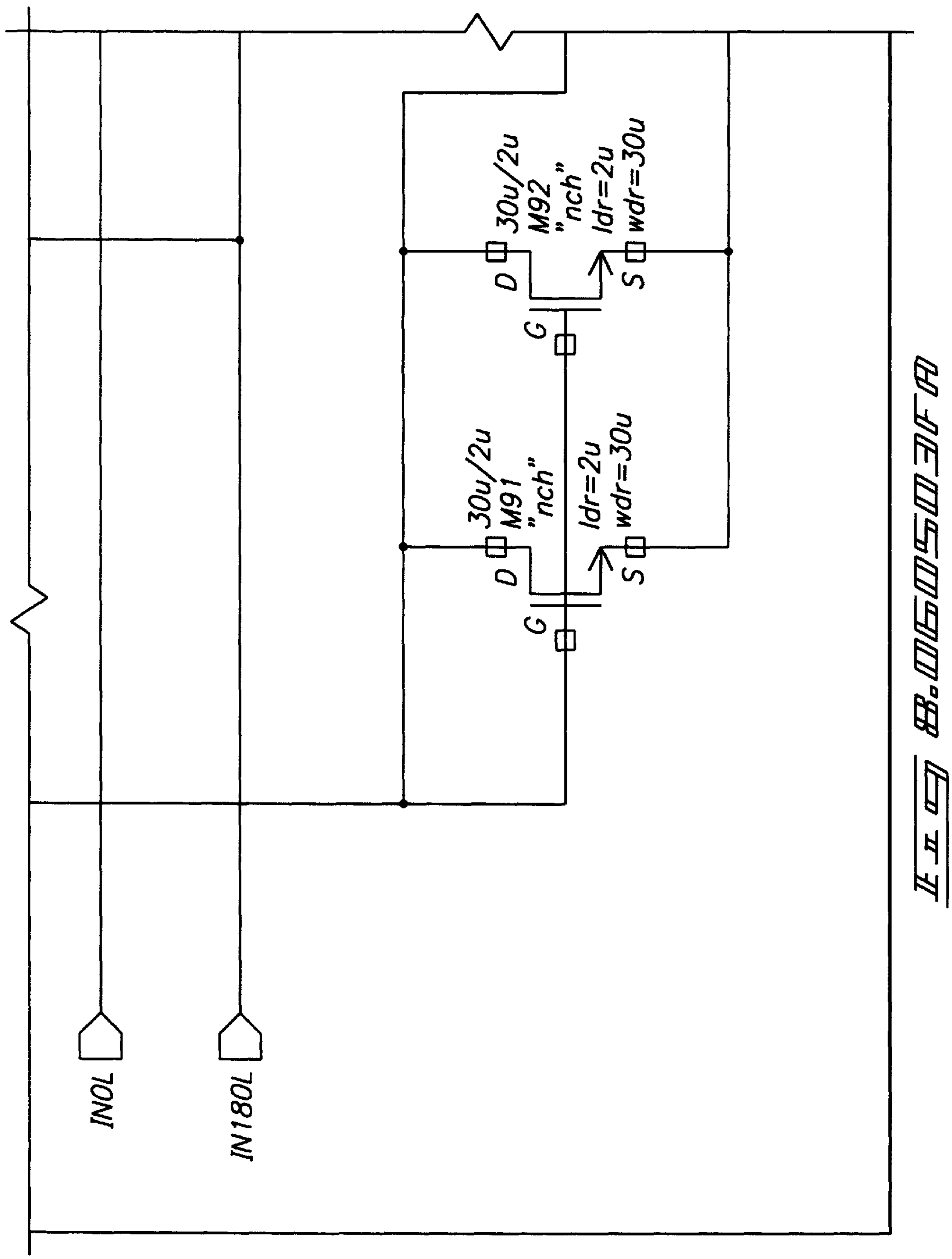
FIG. 8.060503FA

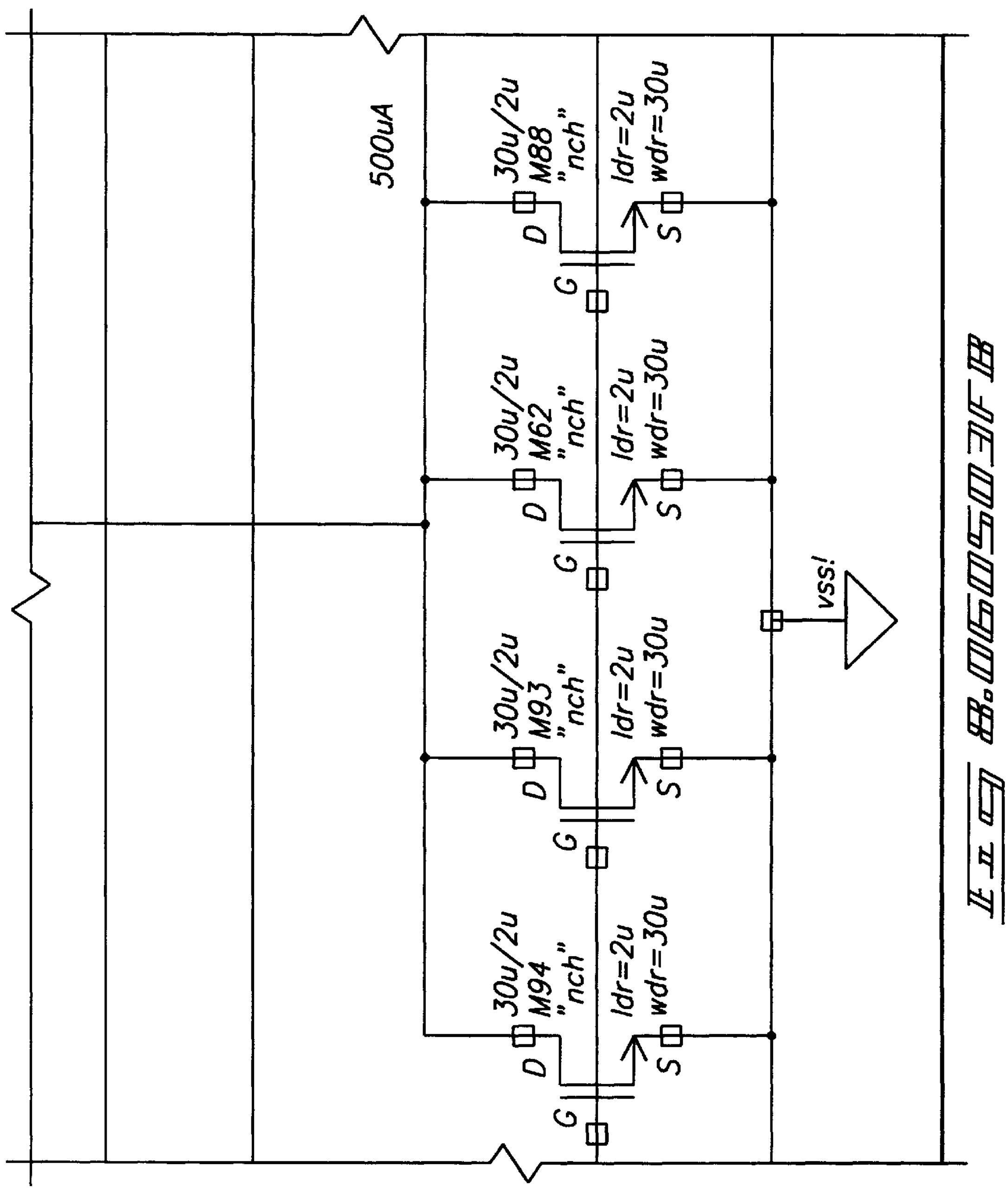
Fig. 8.060503F B

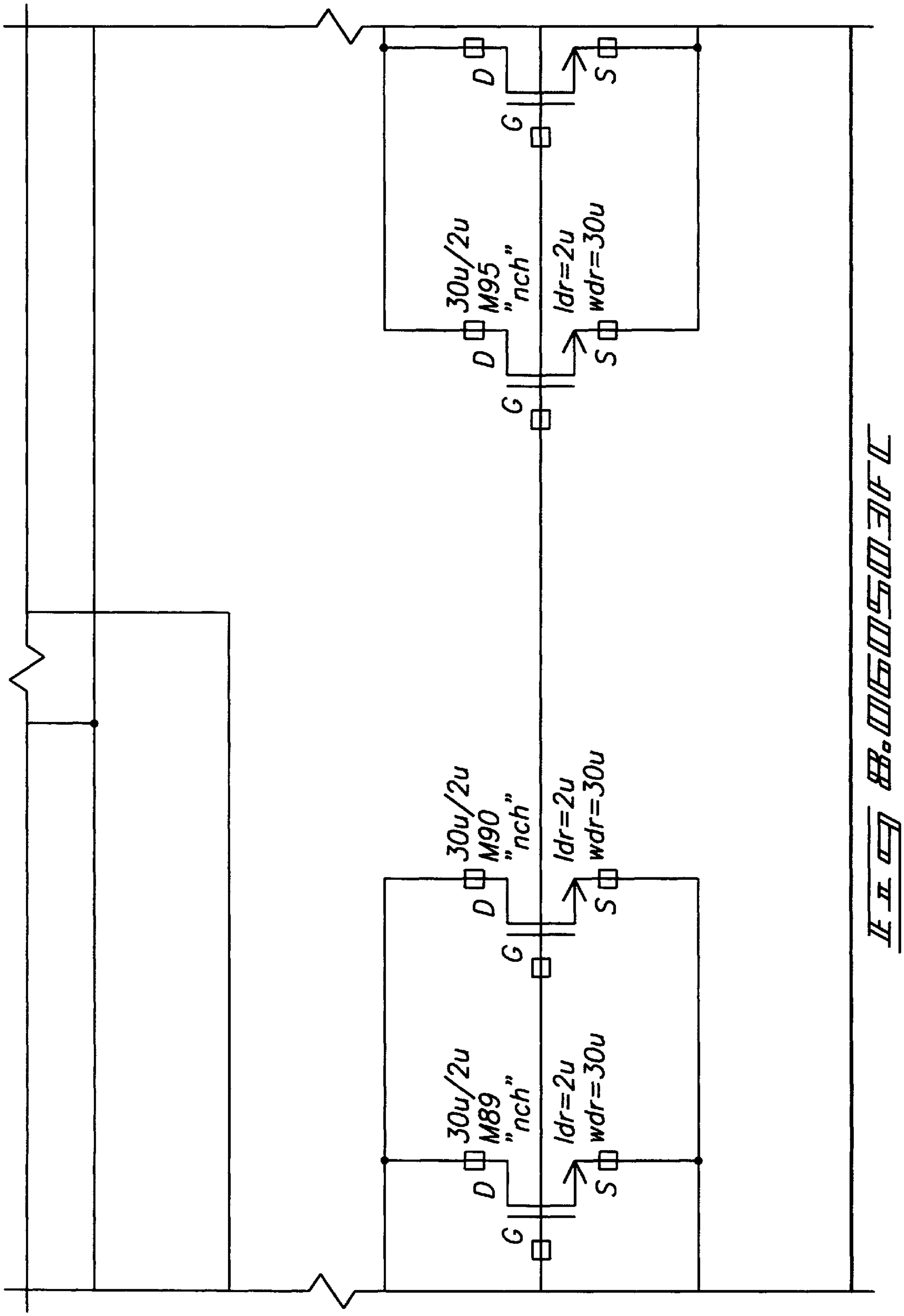
FIG. 8.060503FC

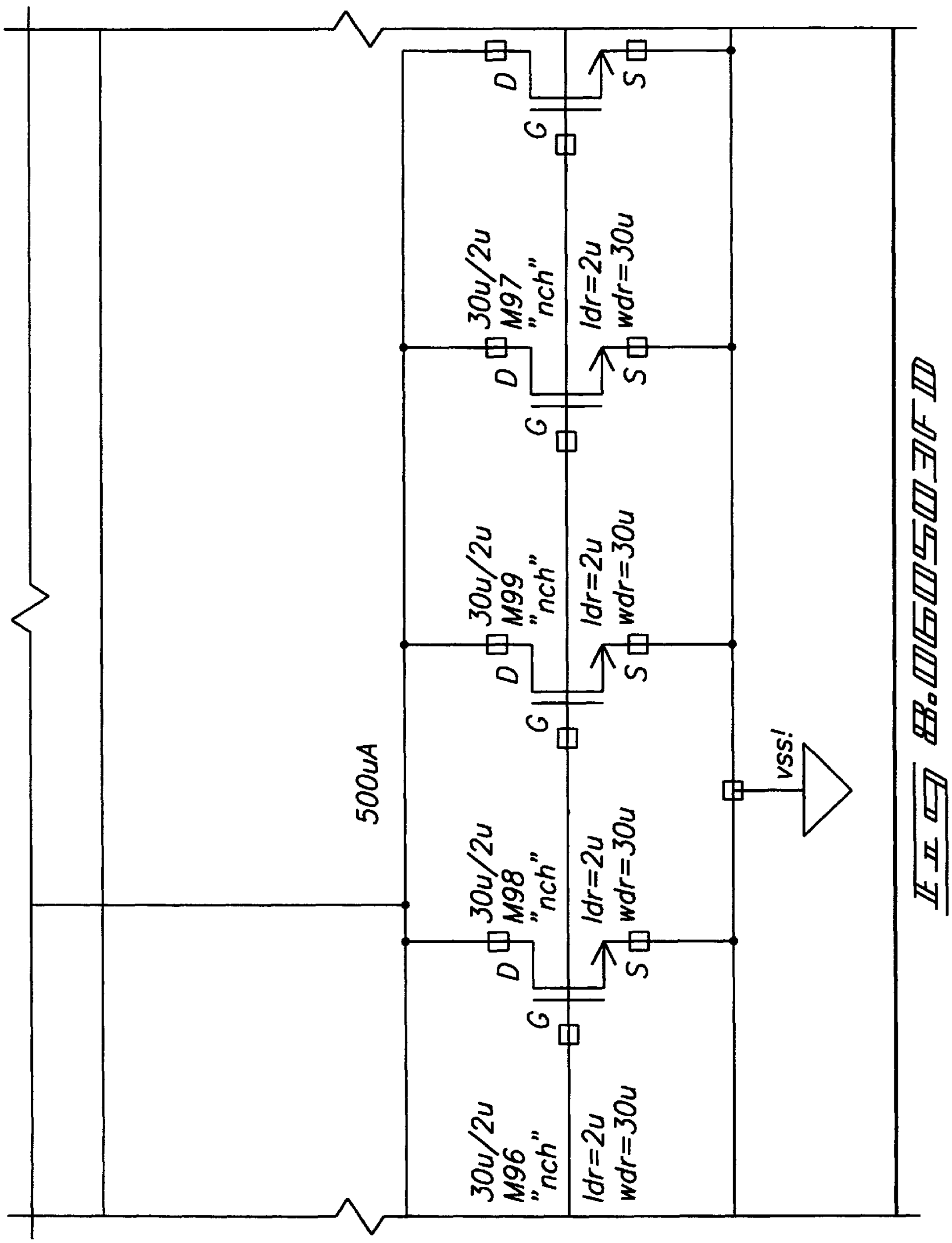
FIG. 8.060503FD

NOTES
Use 50u segments for all devices.
Minimize capacitance on all nodes (drains have priority).
Share all source and drain nodes.
Allow +/- 20% adjustment on resistors at power supply end.
IBIAS=2mA
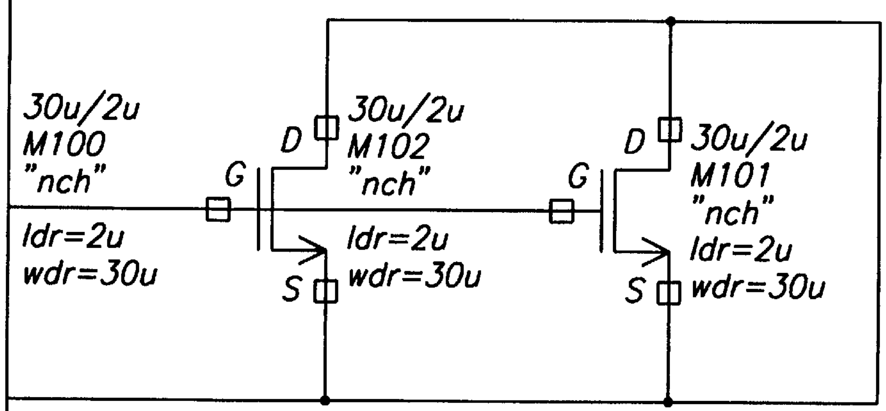
Fig. 8.060503FE

| | | | | | | | | |
|---|---|---|---|---|---|---|---|---|
| 8.0606AA | 8.0606AB | 8.0606AC | 8.0606AD | 8.0606AE | 8.0606AF | 8.0606AG | 8.0606AH | |
| 8.0606BA | 8.0606BB | 8.0606BC | 8.0606BD | 8.0606BE | 8.0606BF | 8.0606BG | 8.0606BH | |
| 8.0606CA | 8.0606CB | 8.0606CC | 8.0606CD | 8.0606CE | 8.0606CF | 8.0606CG | 8.0606CH | 8.0606CI |
| 8.0606DA | 8.0606DB | 8.0606DC | 8.0606DD | 8.0606DE | 8.0606DF | 8.0606DG | 8.0606DH | 8.0606DI |
| 8.0606EA | 8.0606EB | 8.0606EC | 8.0606ED | 8.0606EE | 8.0606EF | 8.0606EG | 8.0606EH | 8.0606EI |
| 8.0606FA | 8.0606FB | 8.0606FC | 8.0606FD | 8.0606FE | 8.0606FF | 8.0606FG | 8.0606FH | 8.0606FI |
| | | 8.0606GC | 8.0606GD | 8.0606GE | | | | |
| 8.0606HA | 8.0606HB | 8.0606HC | 8.0606HD | 8.0606HE | | | | |
| | | 8.0606IC | 8.0606ID | 8.0606IE | | | | |

Fig. 8.0606

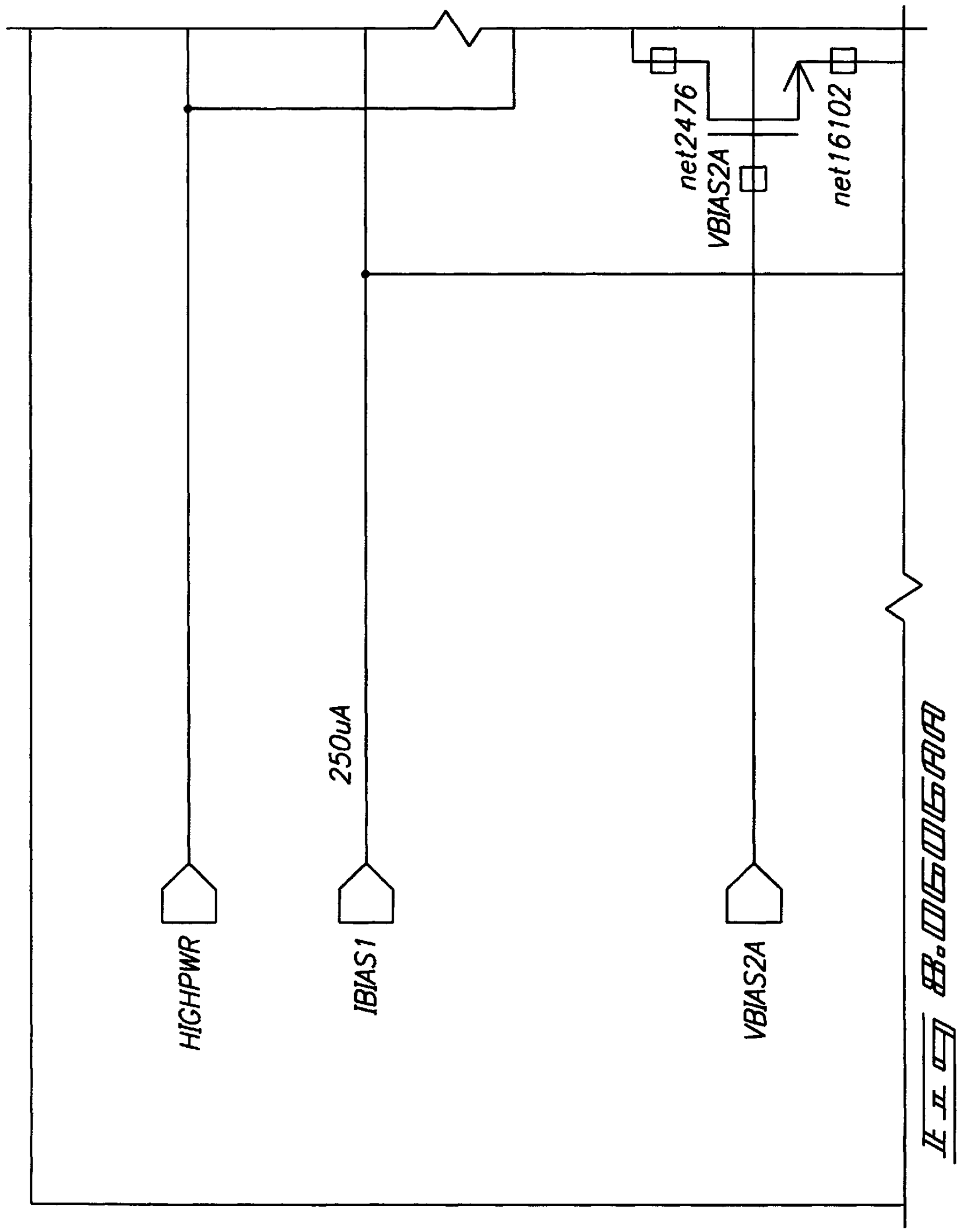
FIG. 8.006GAA

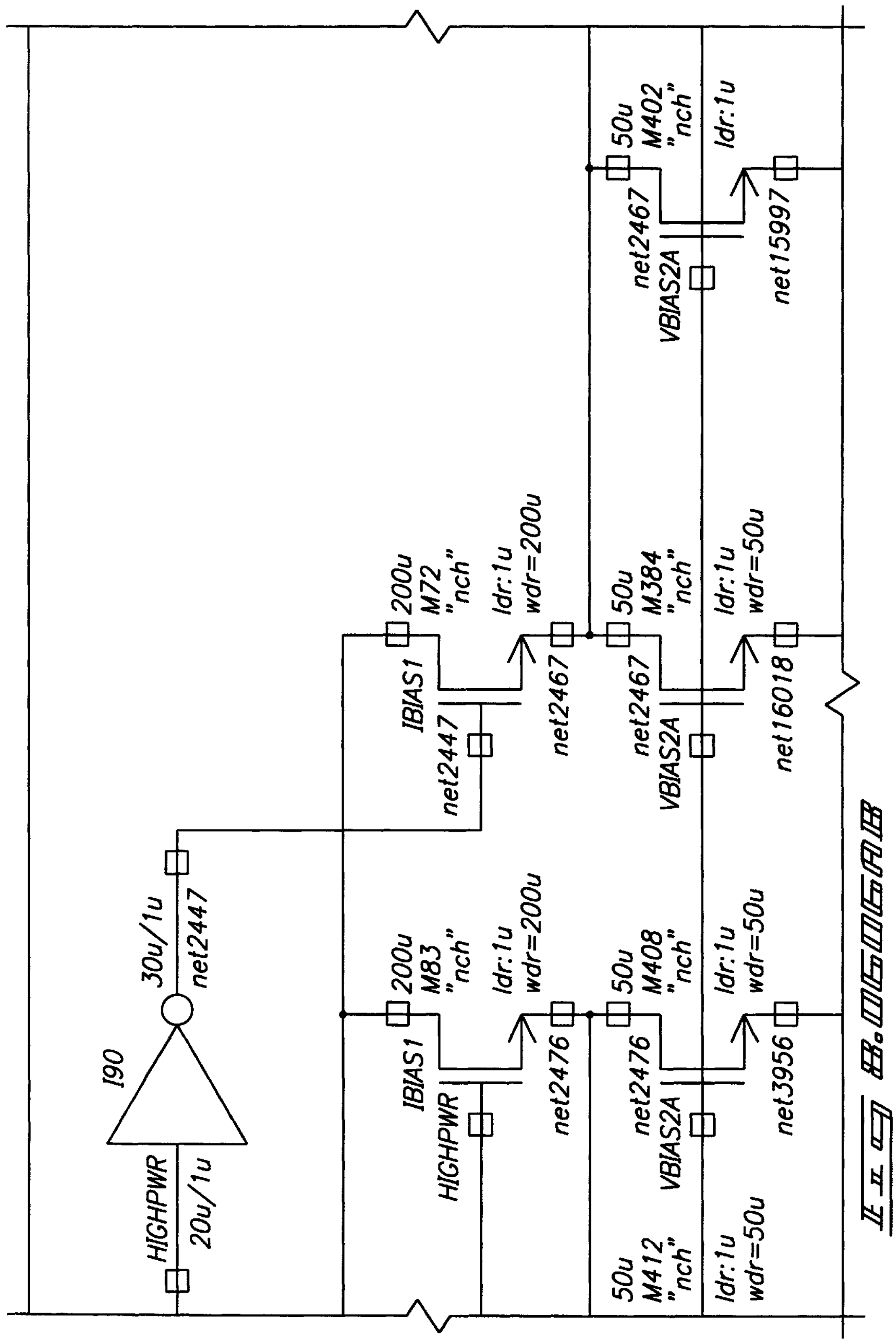
50u
M402
"nch"
ldr:1u
net2467
VBIAS2A
net15997
200u
M72
"nch"
ldr:1u
wdr=200u
IBIAS1
net2447
net2467
50u
M384
"nch"
ldr:1u
wdr=50u
net2467
VBIAS2A
net16018
30u/1u
net2447
I90
HIGHPWR
20u/1u
200u
M83
"nch"
ldr:1u
wdr=200u
IBIAS1
HIGHPWR
net2476
50u
M408
"nch"
ldr:1u
wdr=50u
net2476
VBIAS2A
net3956
50u
M412
"nch"
ldr:1u
wdr=50u

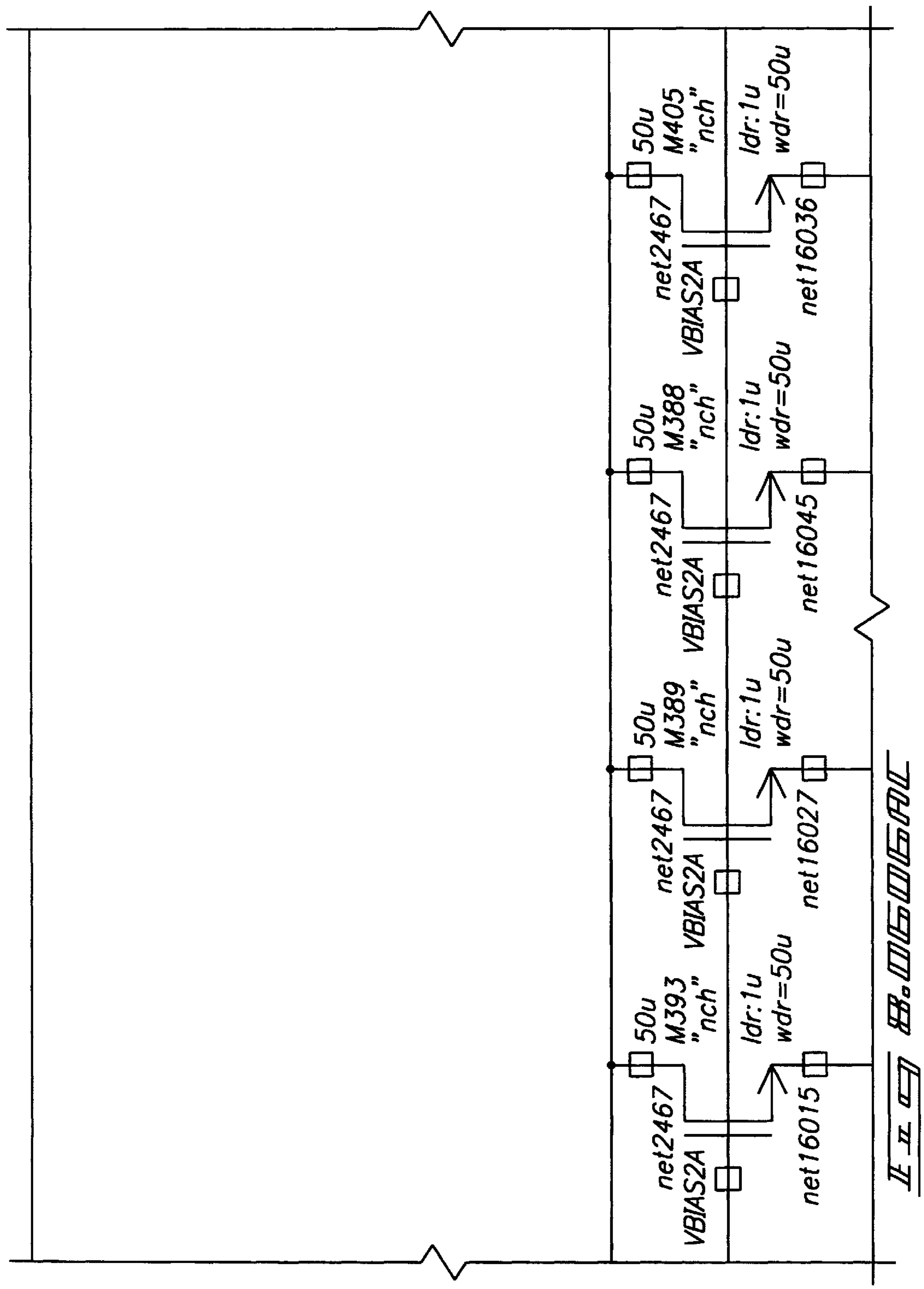
FIG. 8.0606AL

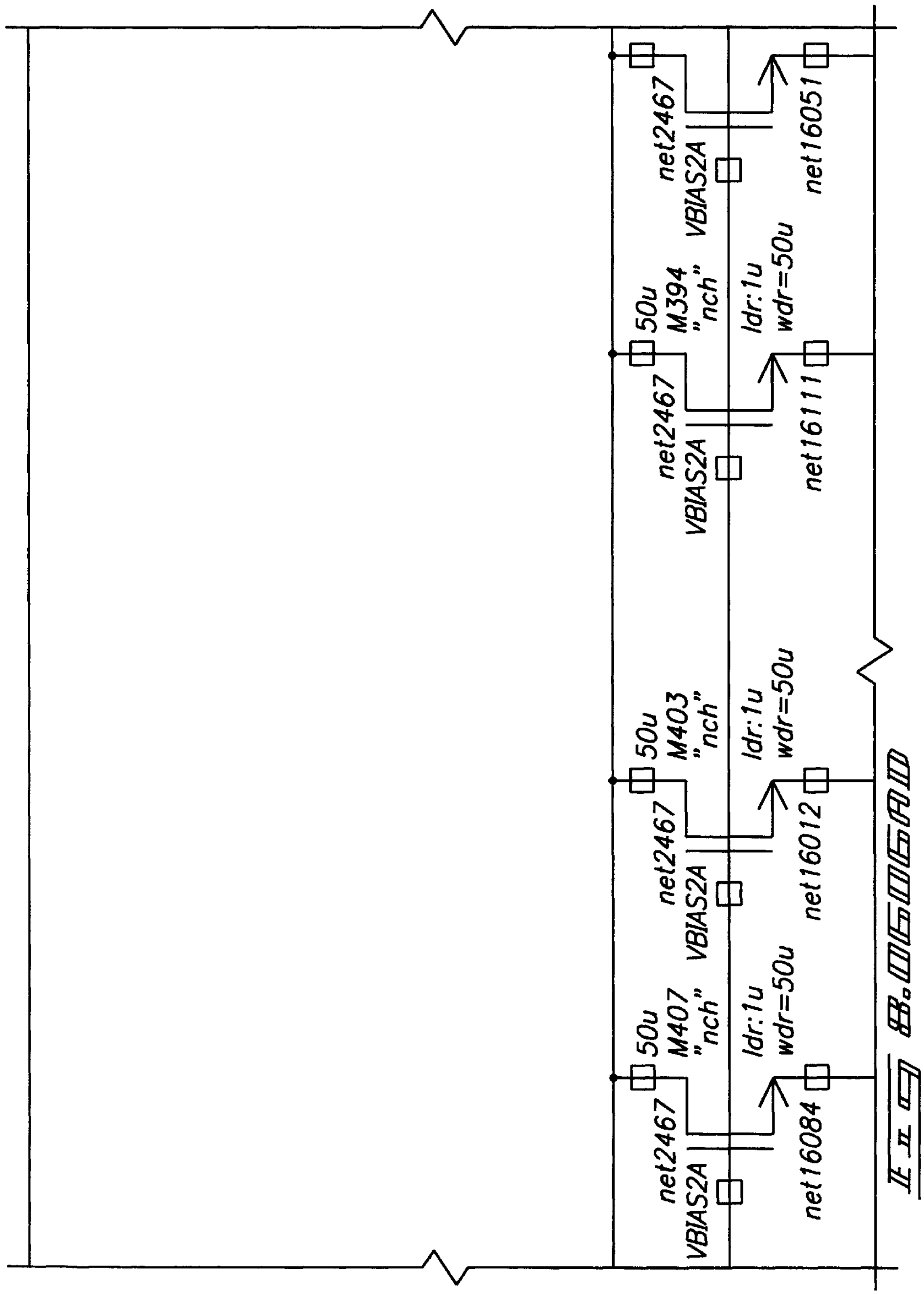
net2467
VBIAS2A
net16051
50u
M394
"nch"
ldr:1u
wdr=50u
net2467
VBIAS2A
net16111
50u
M403
"nch"
ldr:1u
wdr=50u
net2467
VBIAS2A
net16012
50u
M407
"nch"
ldr:1u
wdr=50u
net2467
VBIAS2A
net16084

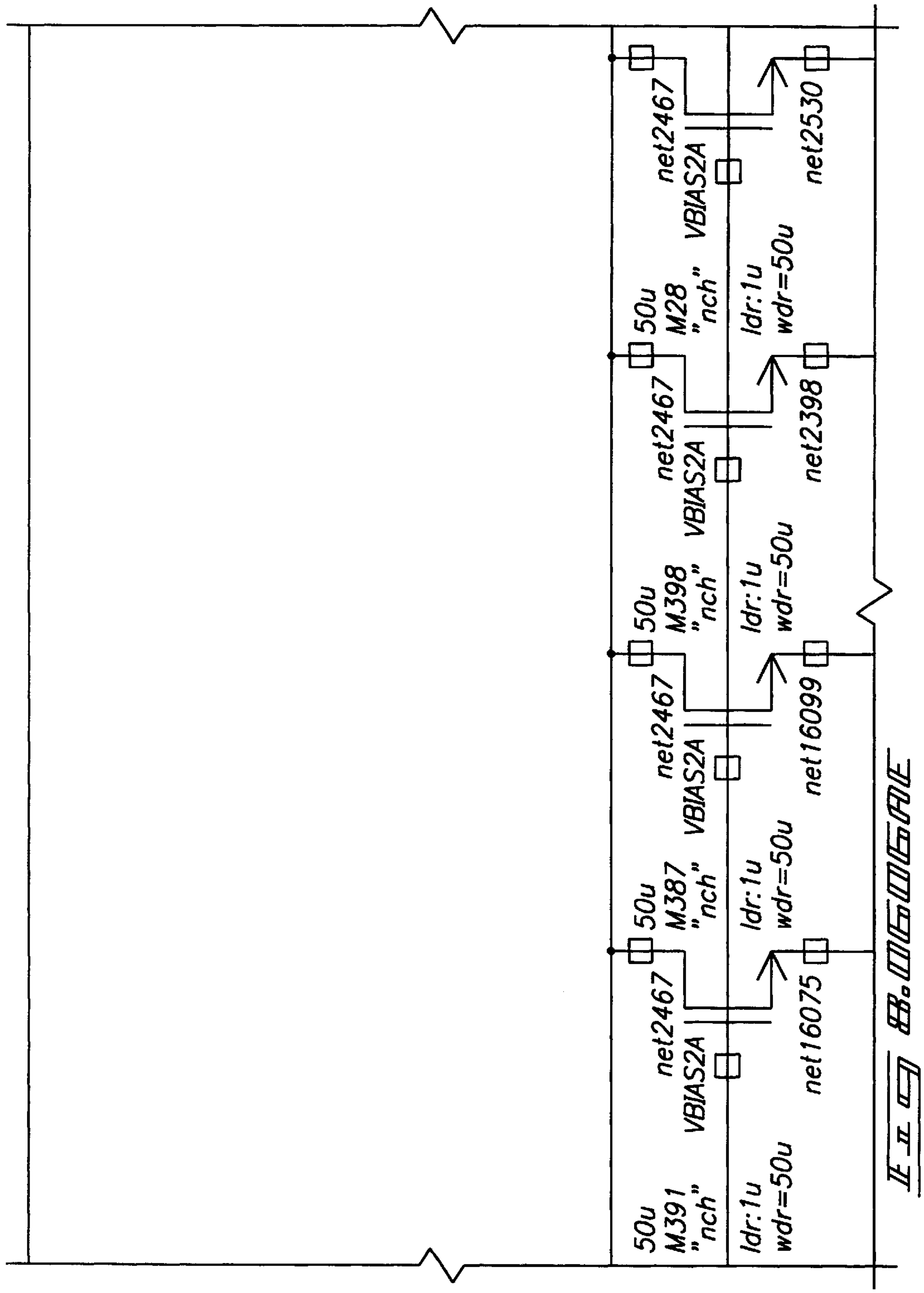
FIG. 8.006AE

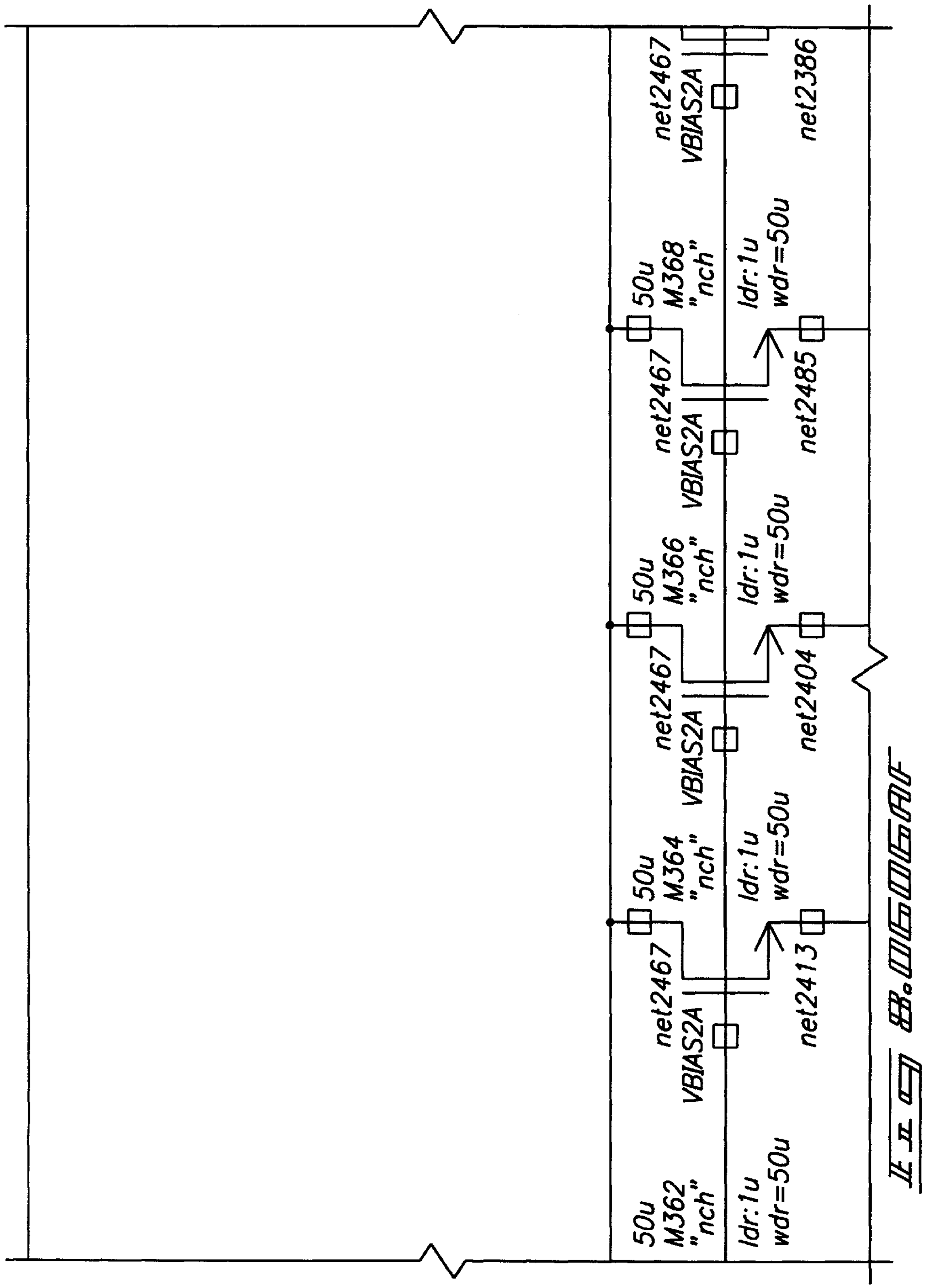
FIG. 8.006AF

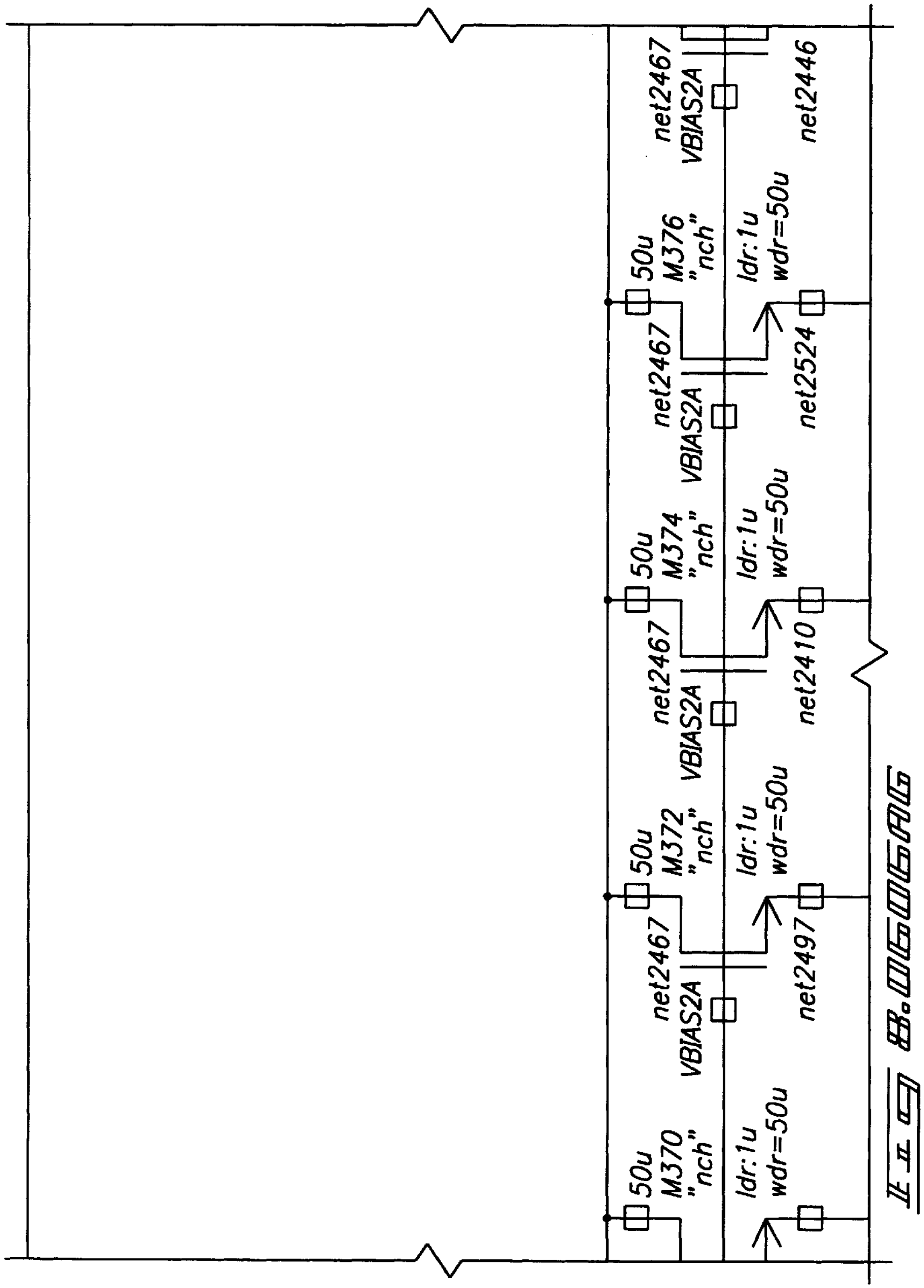
FIG. 8.0606AG

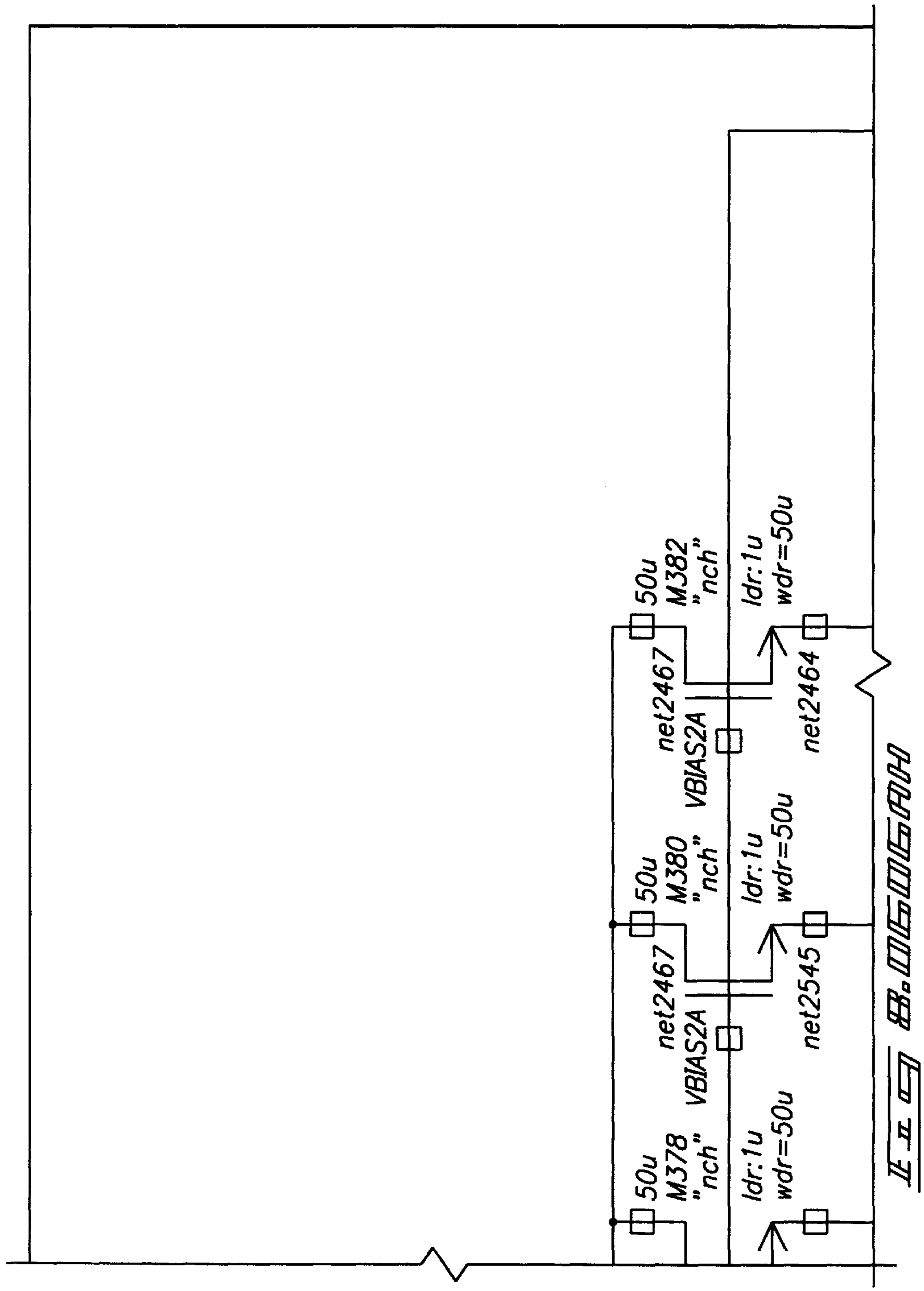
FIG. 8.006GAH

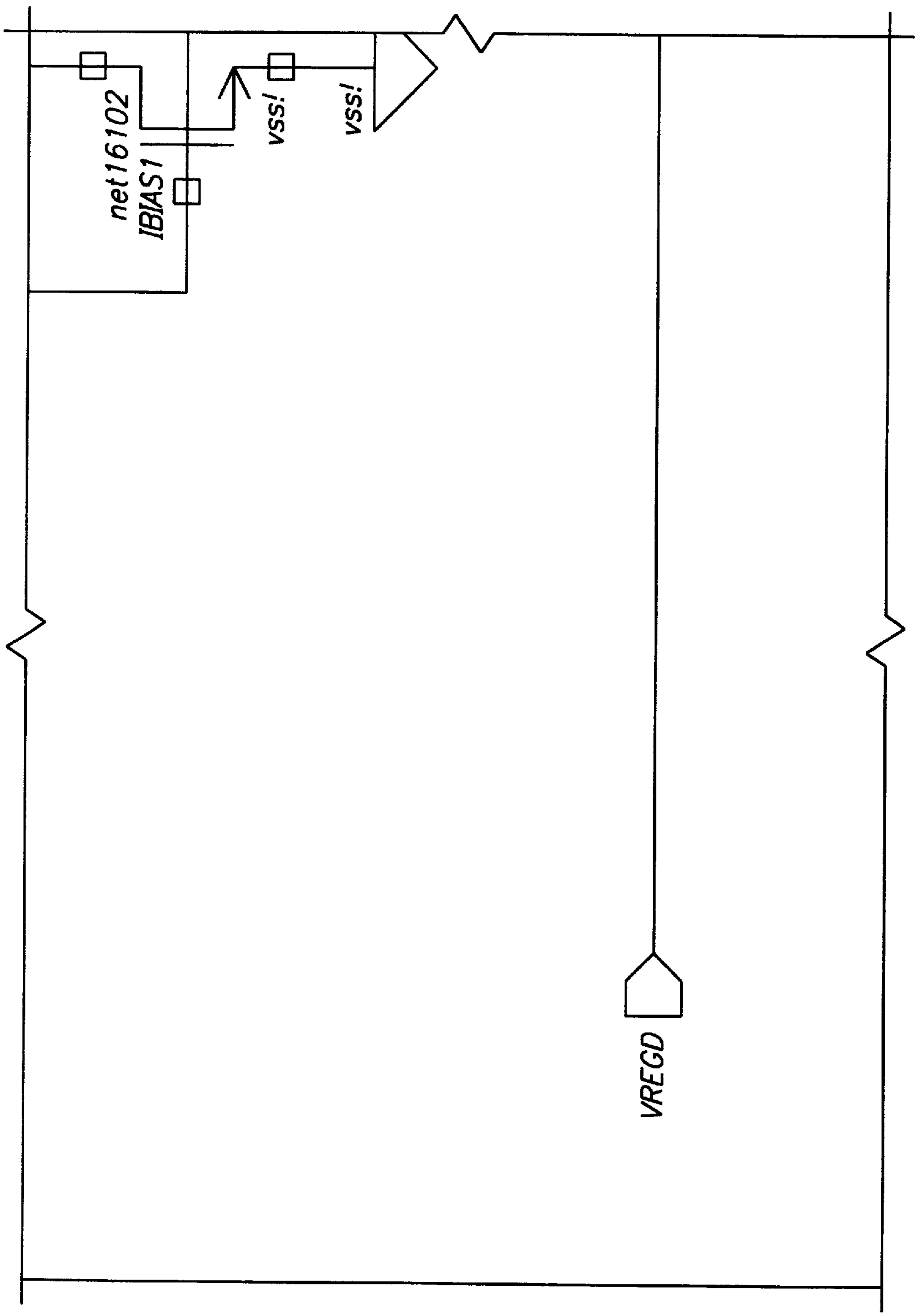
Fig. 8.006BA

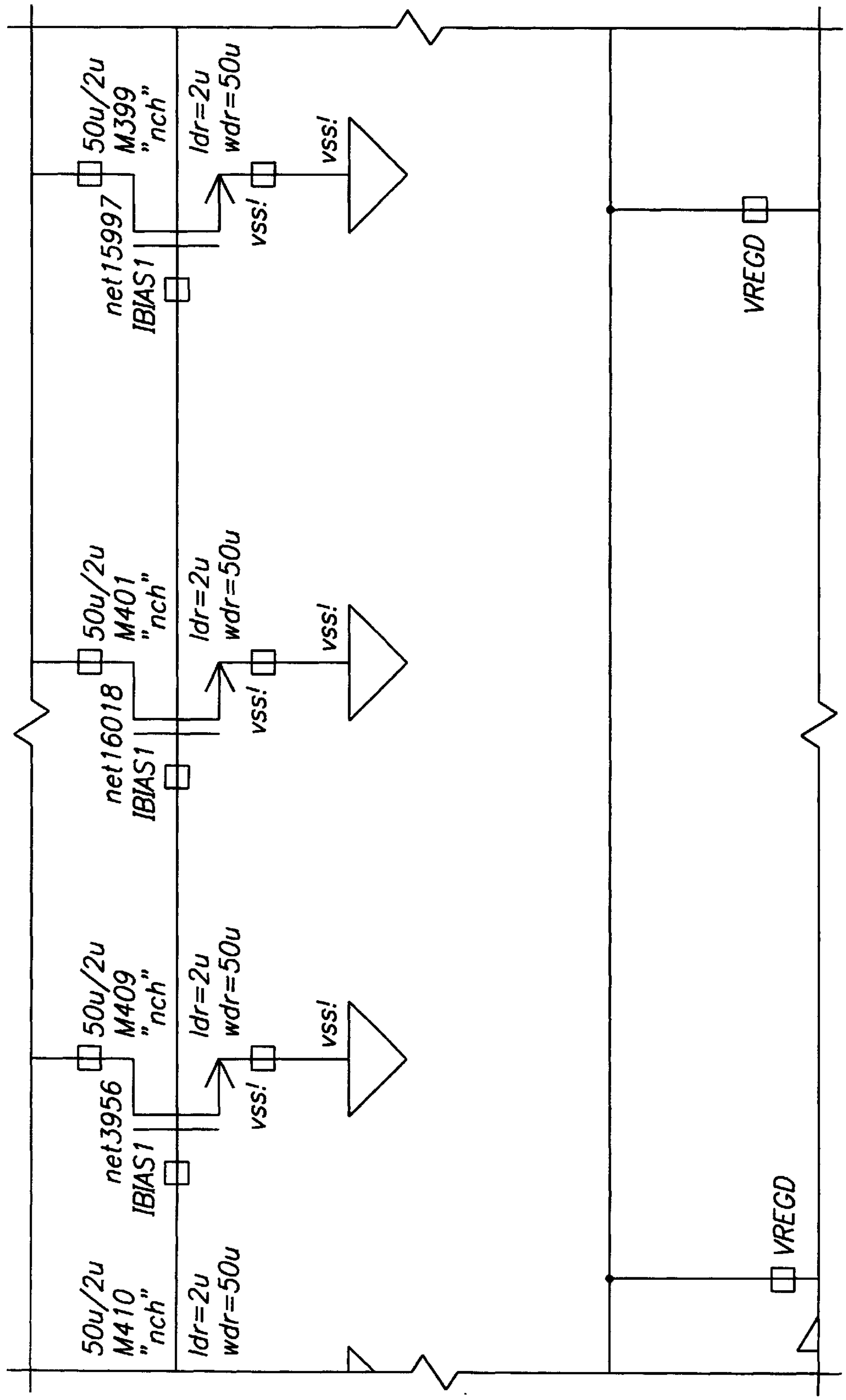
FIG. 8.006B

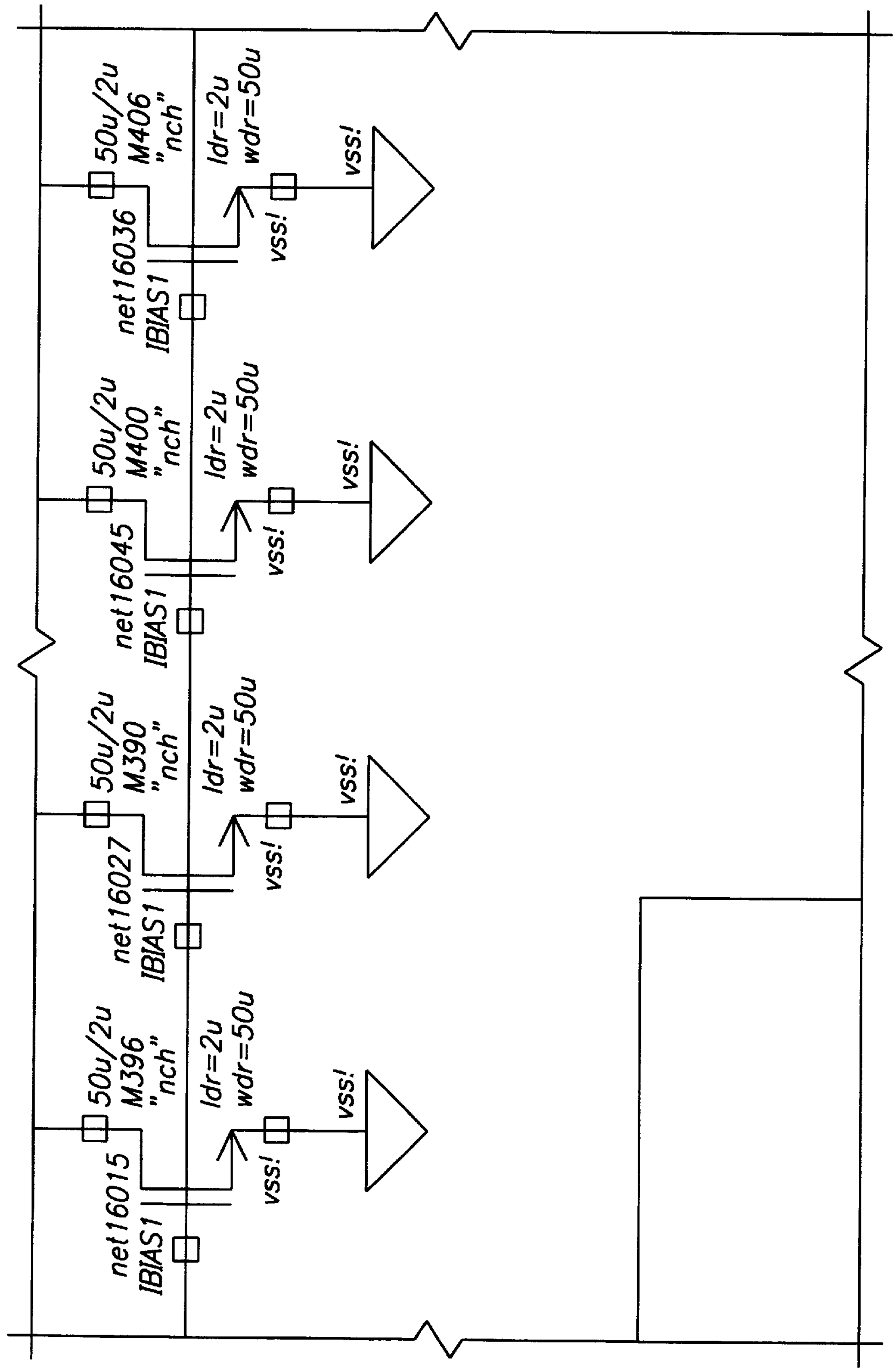
FIG. 8.0606BC

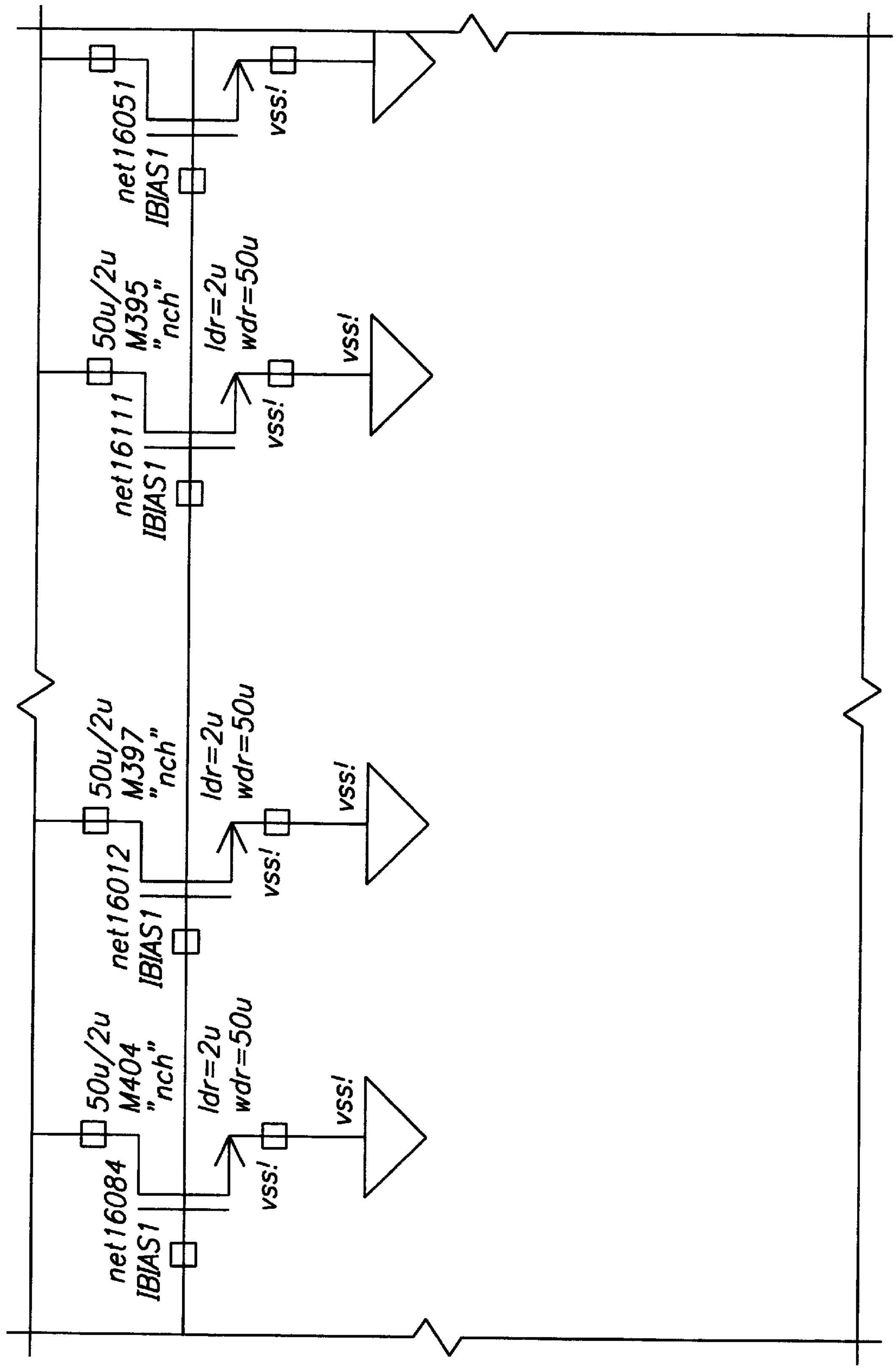
Fig. 8.06GBD

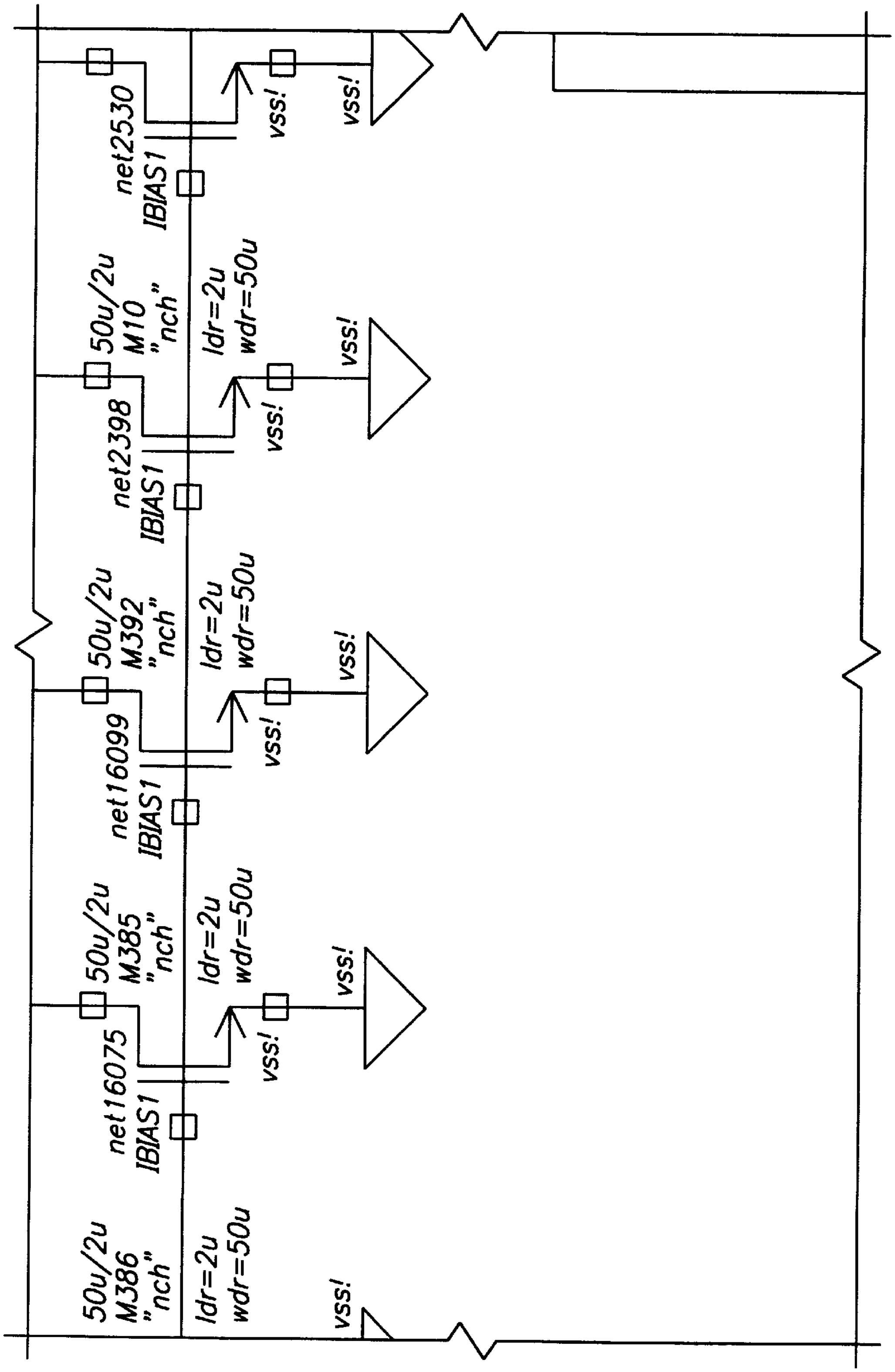
FIG. 8.006BE

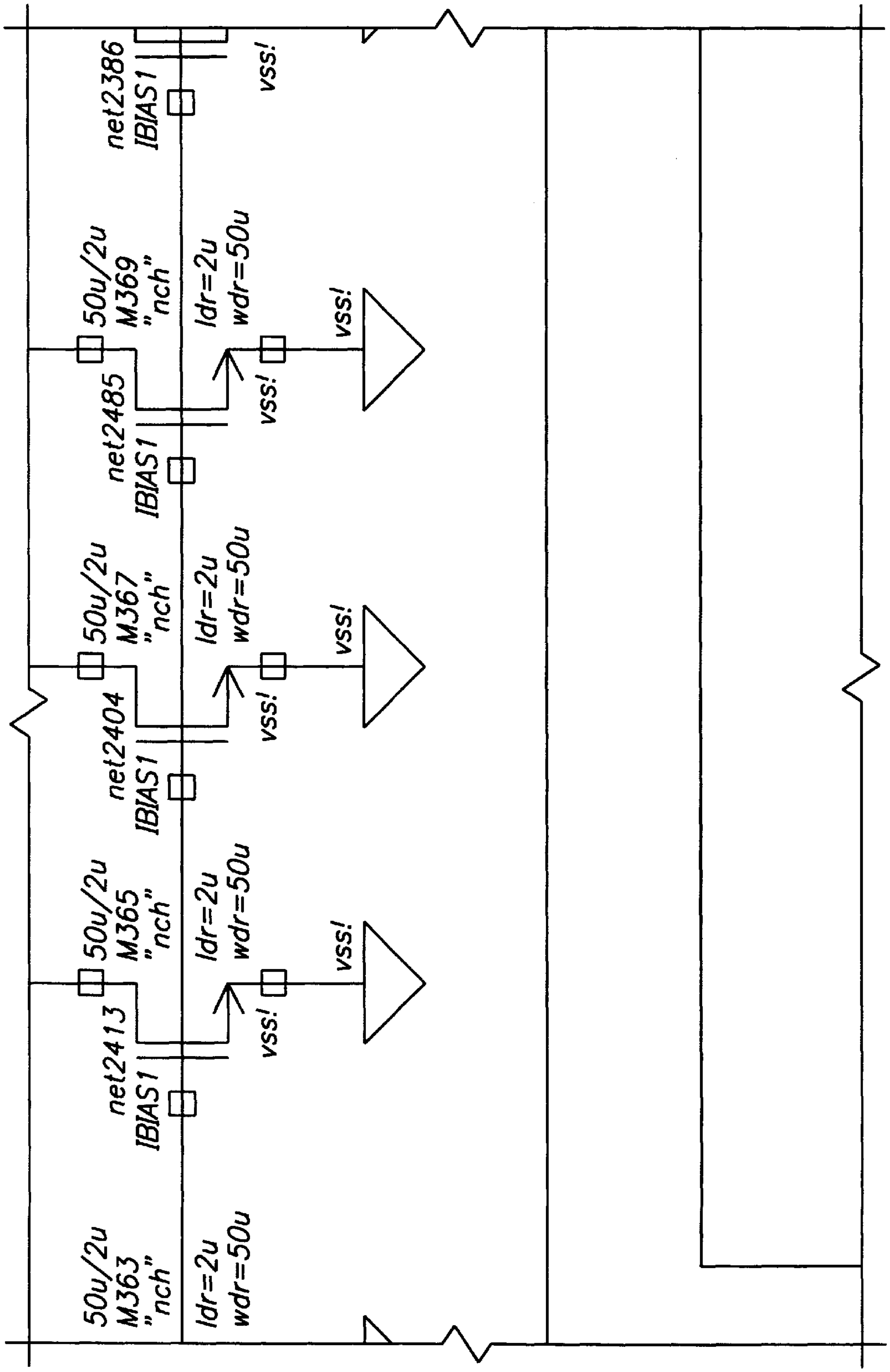
Fig. 8.006BF

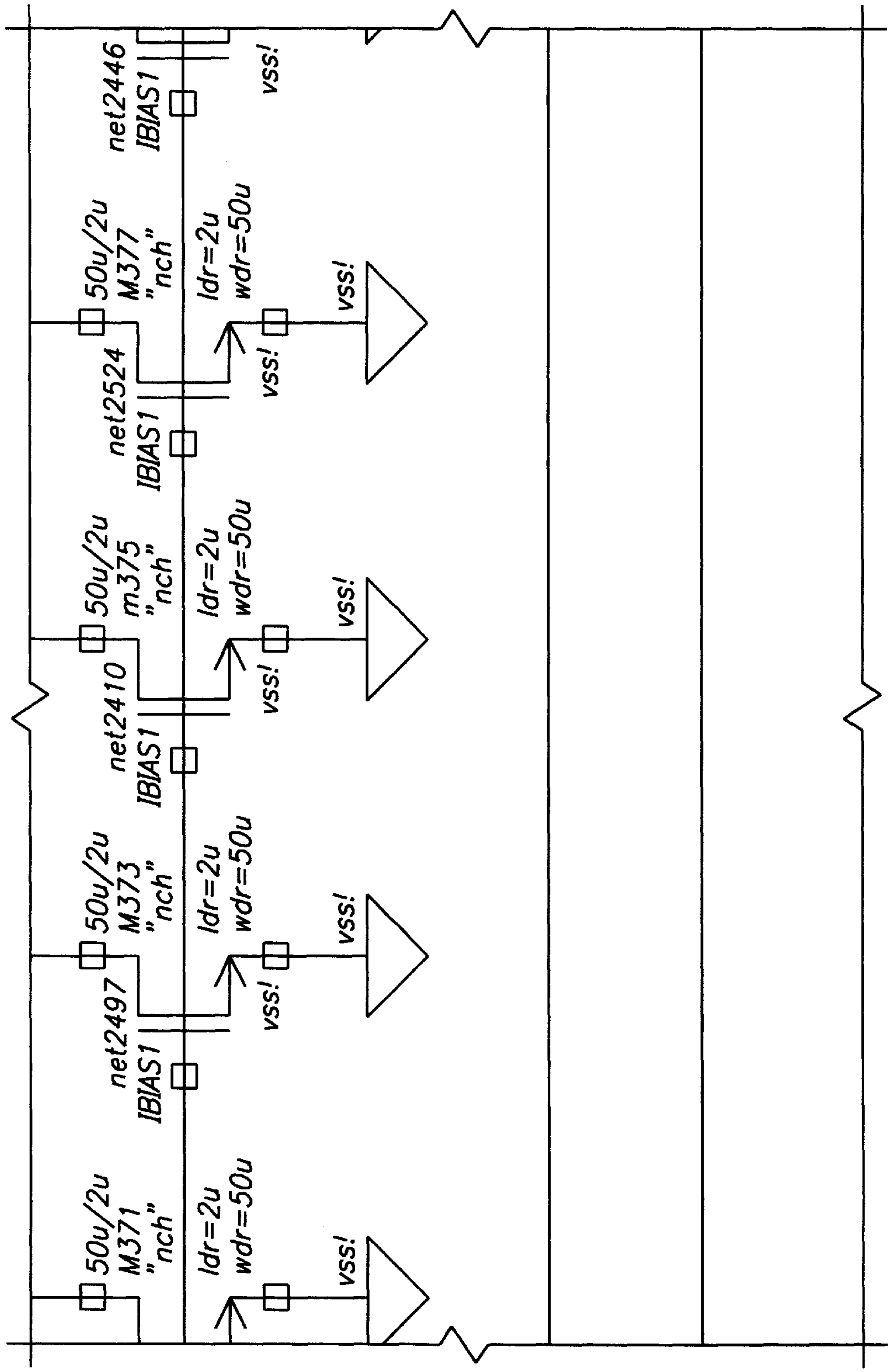
Fig. 8.006BG

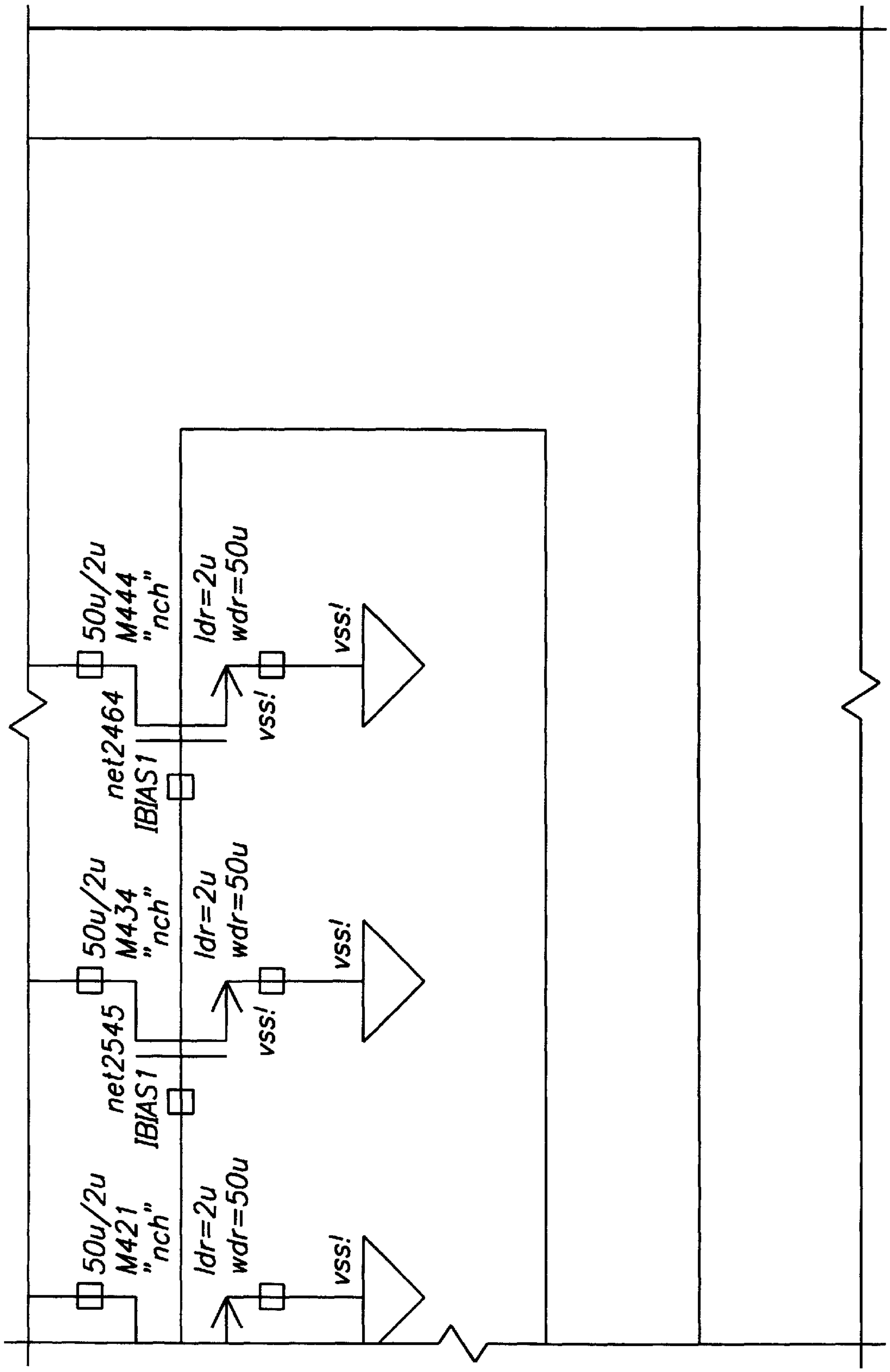
Fig. 8.0G0G8H

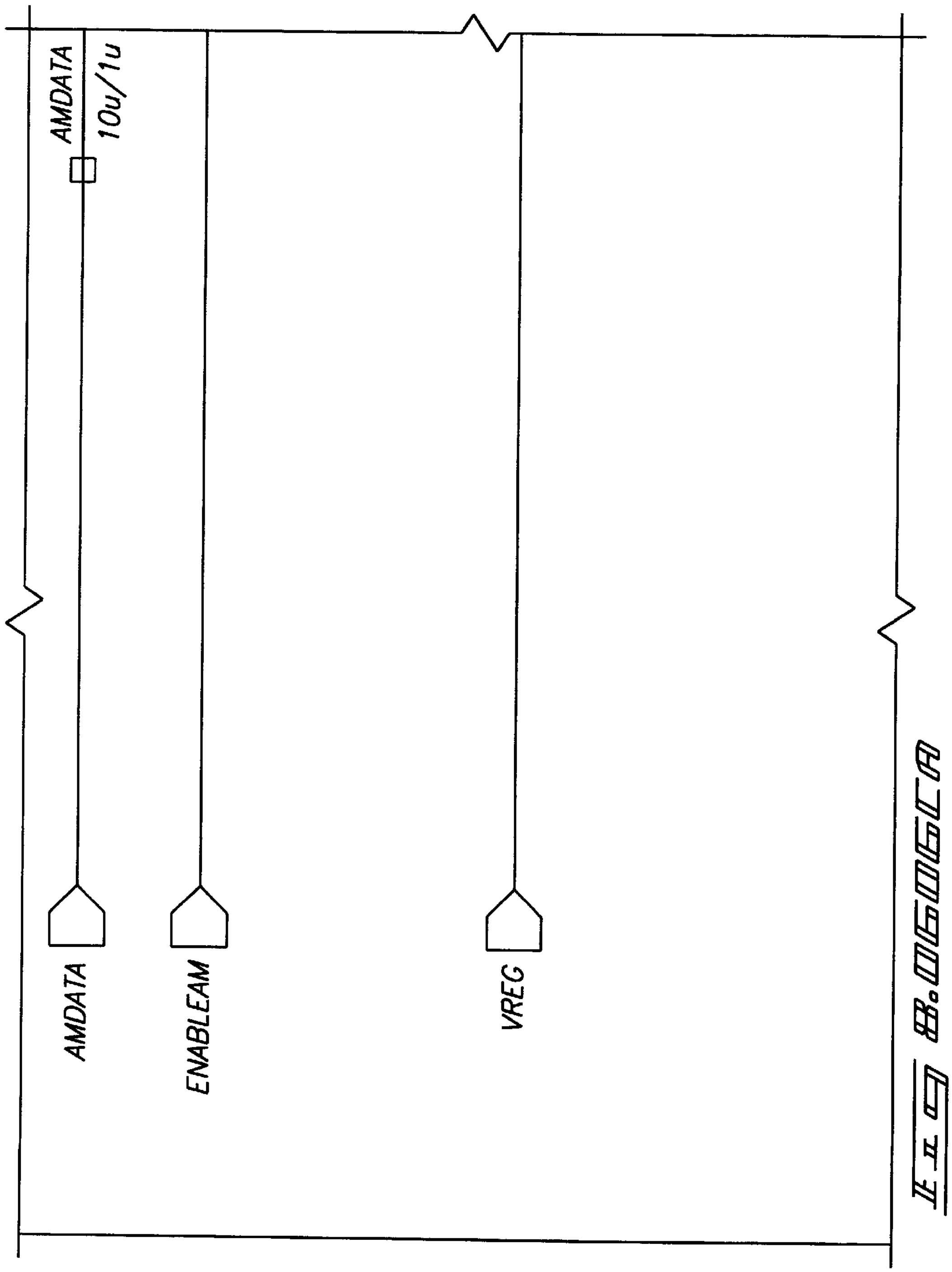
Fig. 8.006CA

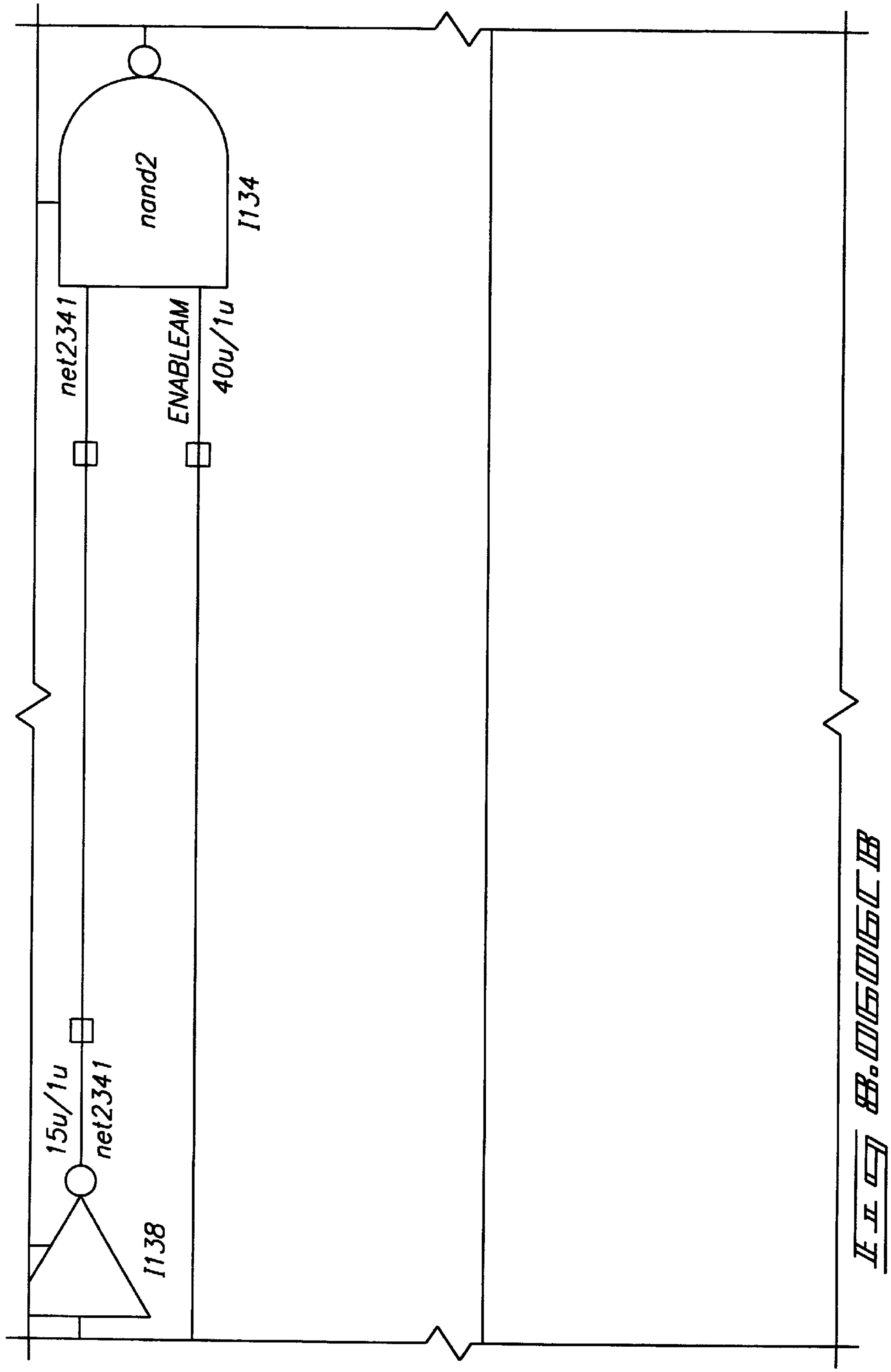
FIG. 8.06GCB

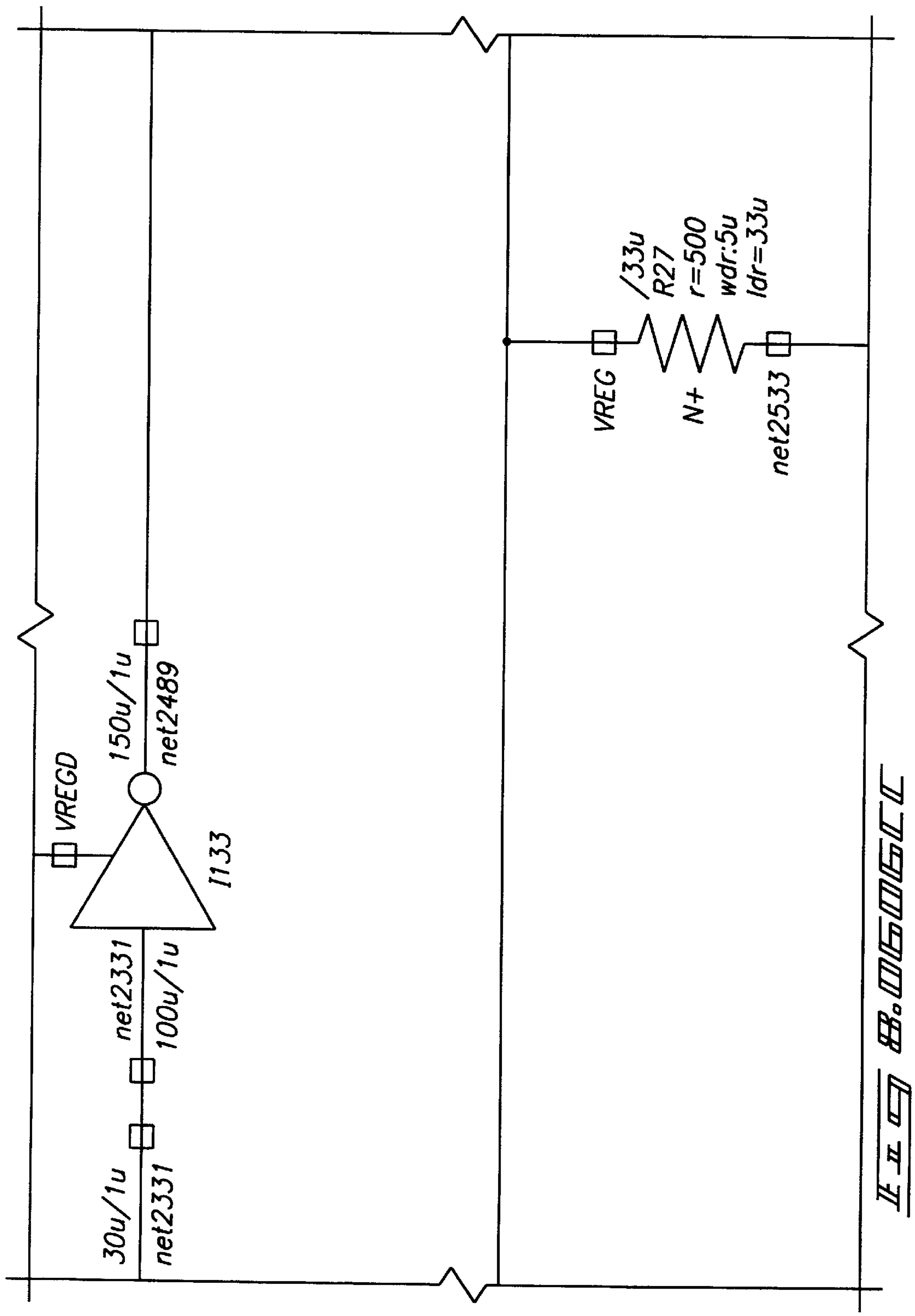
FIG. 8.060GCC

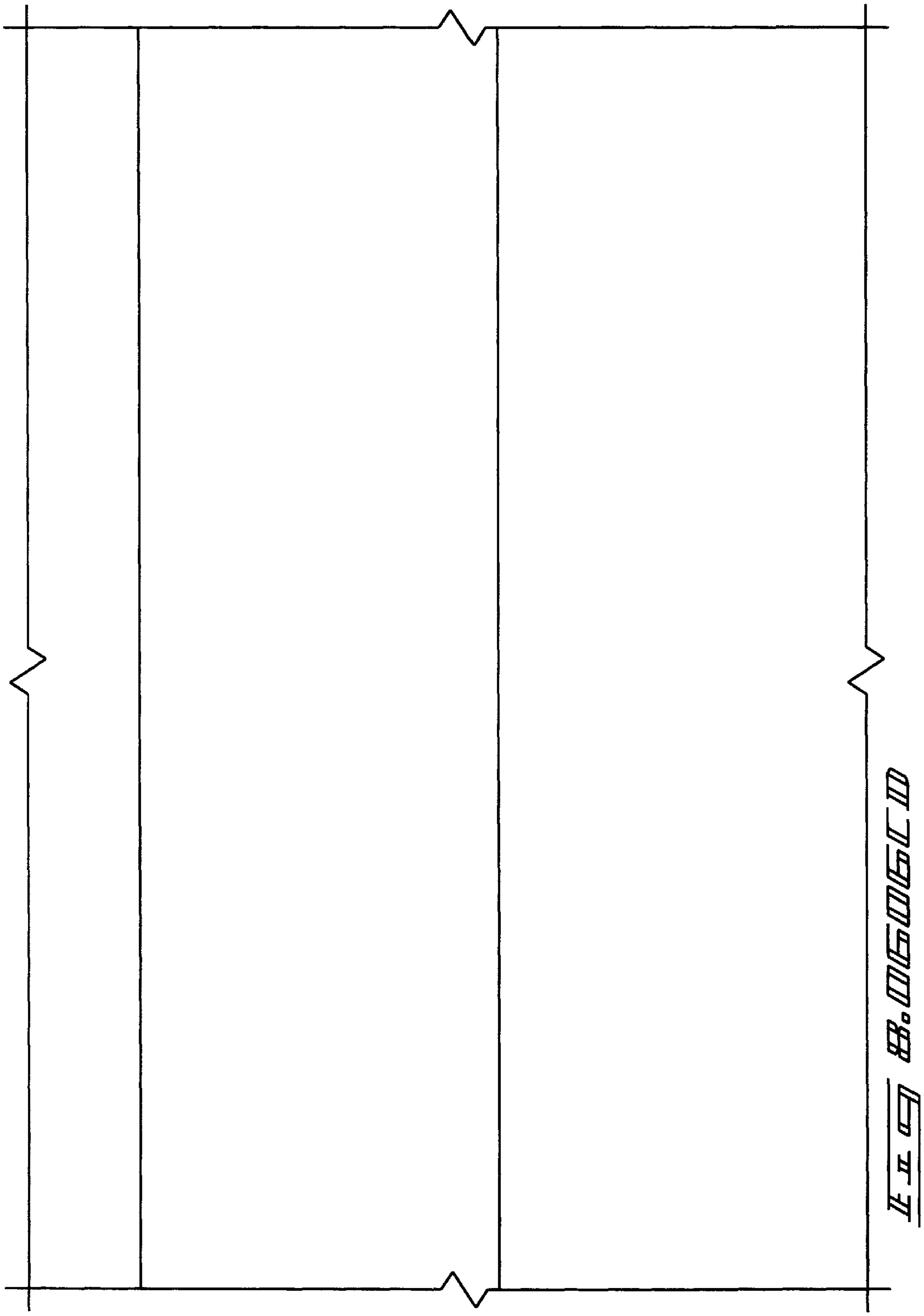
Fig. 8.0606CD

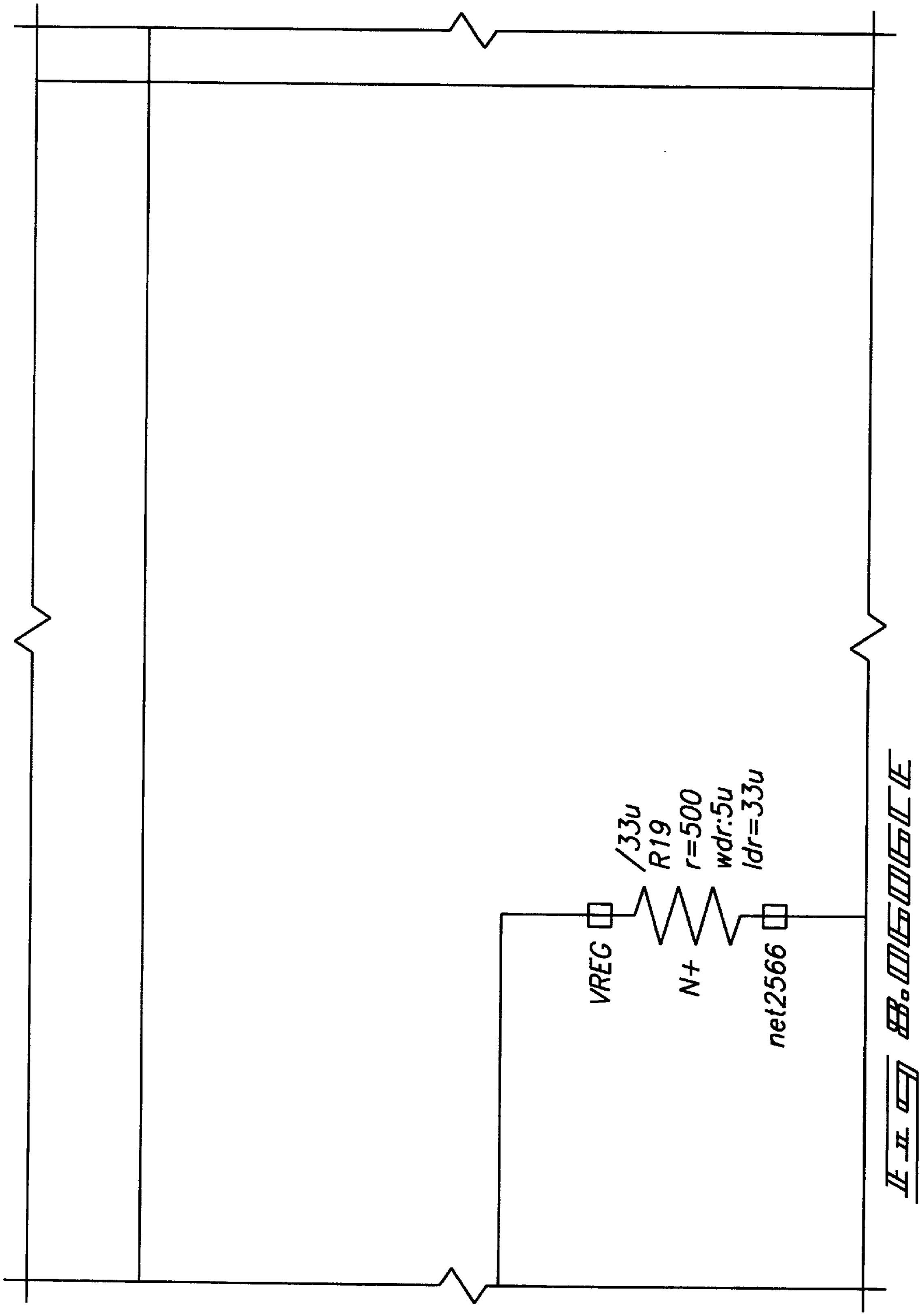
Fig. 8.006GCE

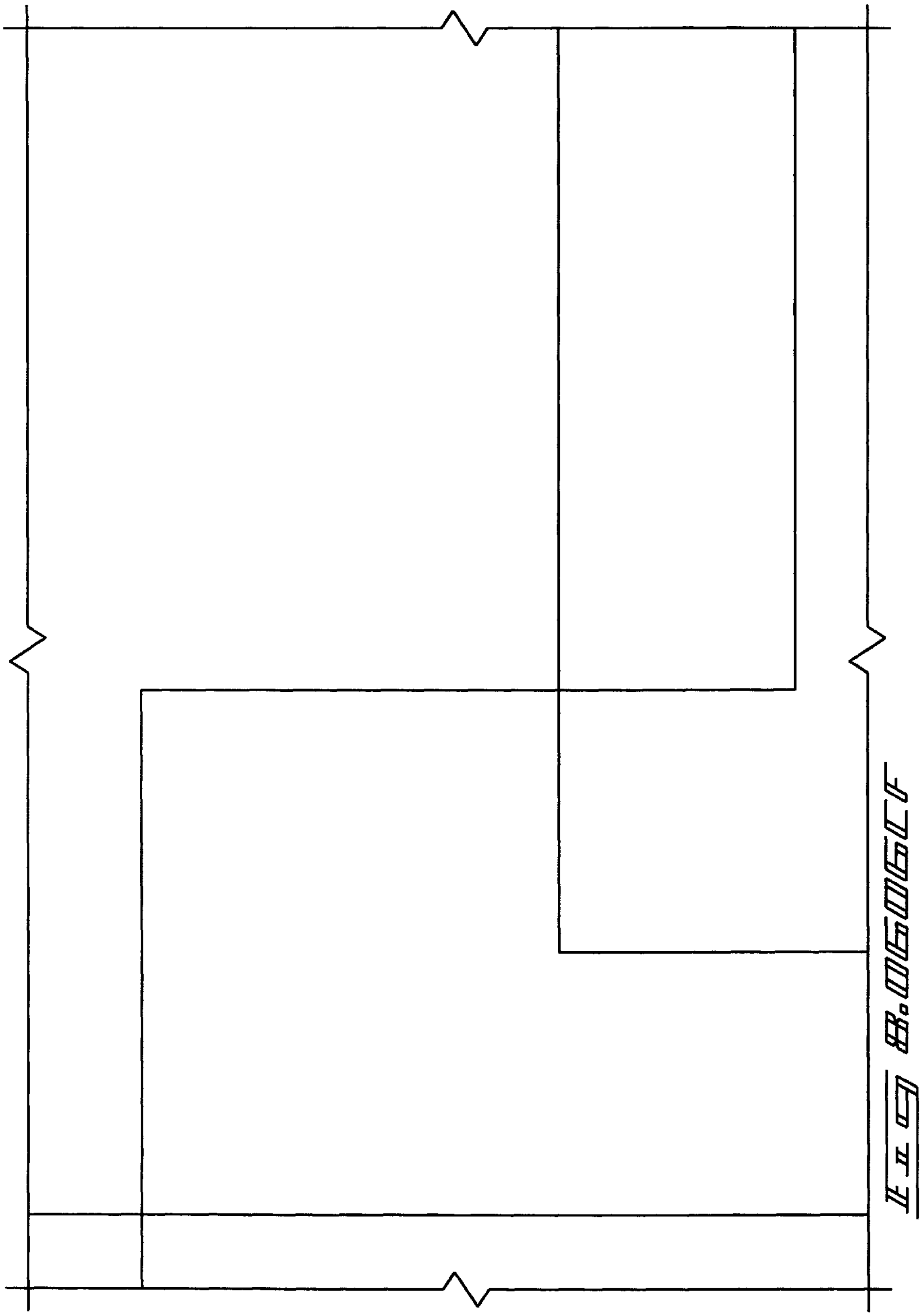
Fig. 8.006CF

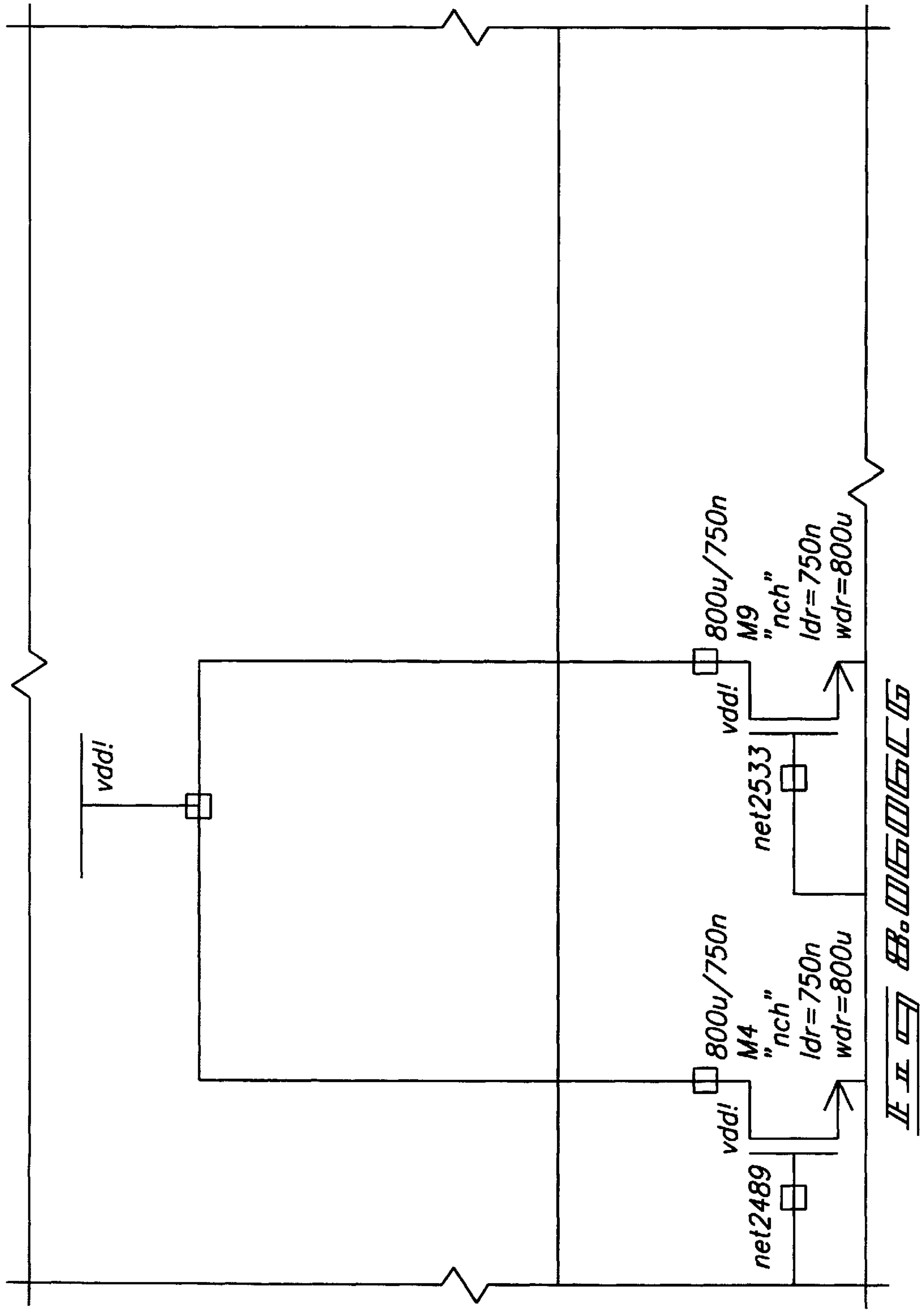
FIG. 8.0606LG

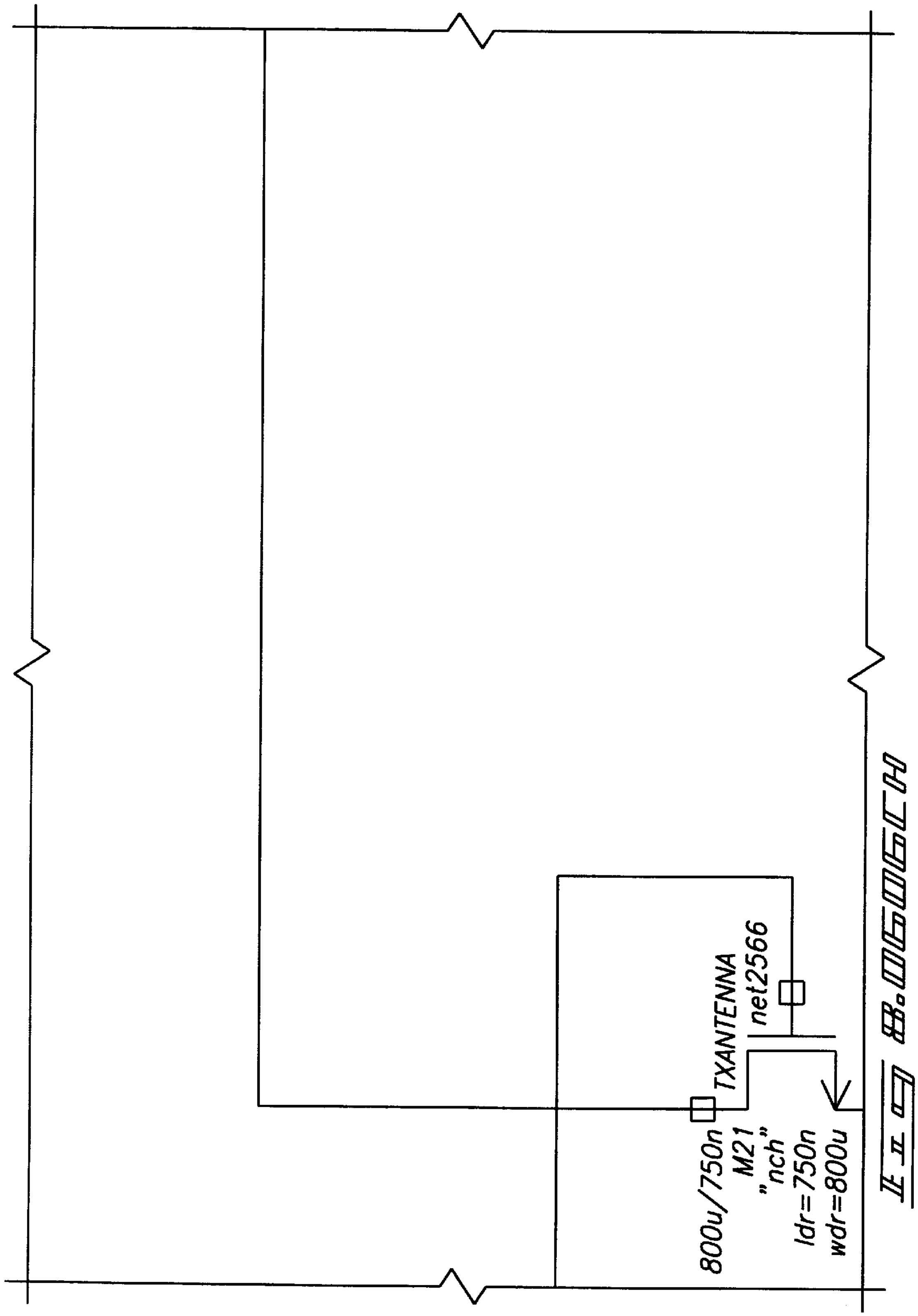
FIG. 8.0606CH

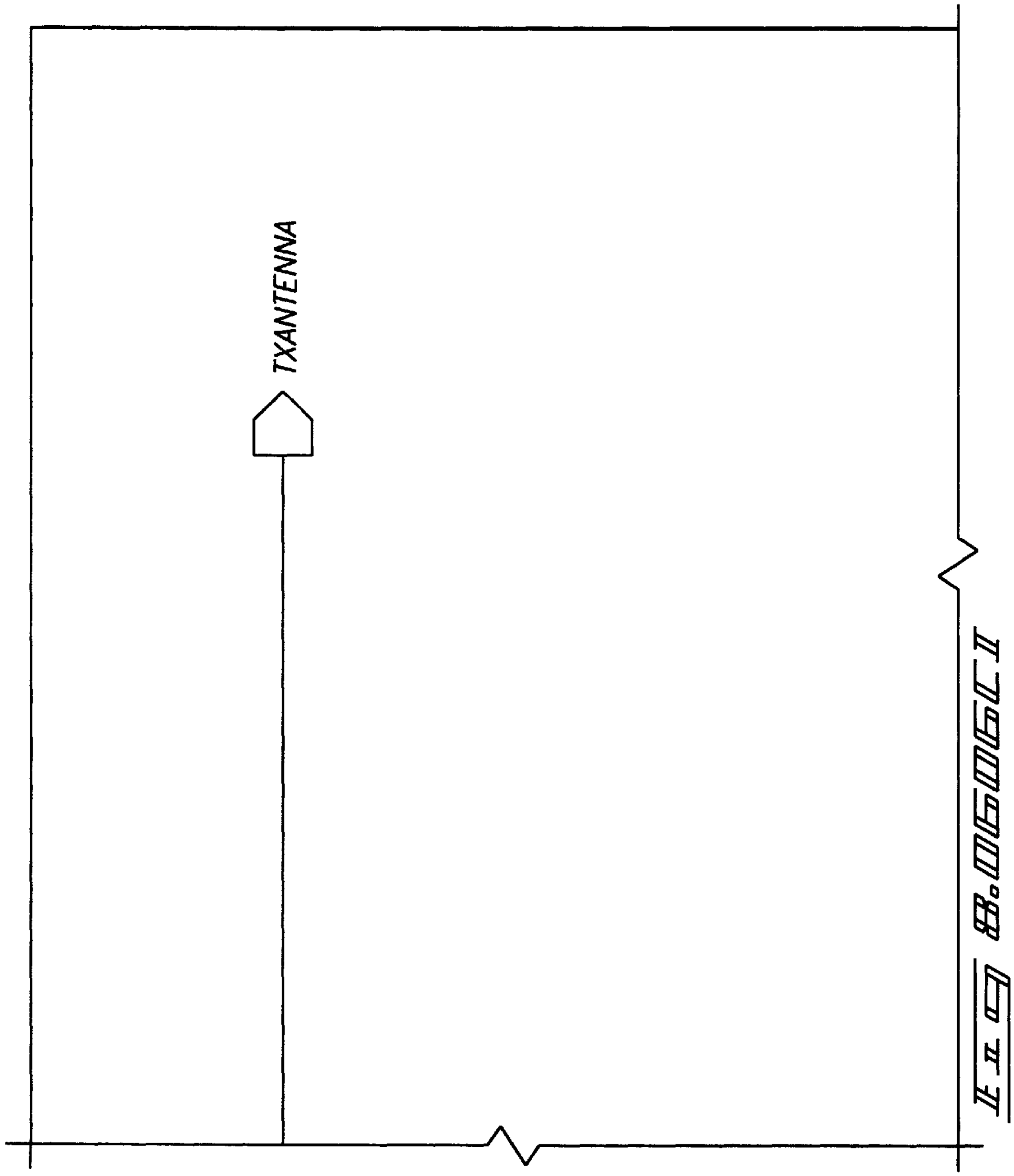
FIG. 8.0606C II

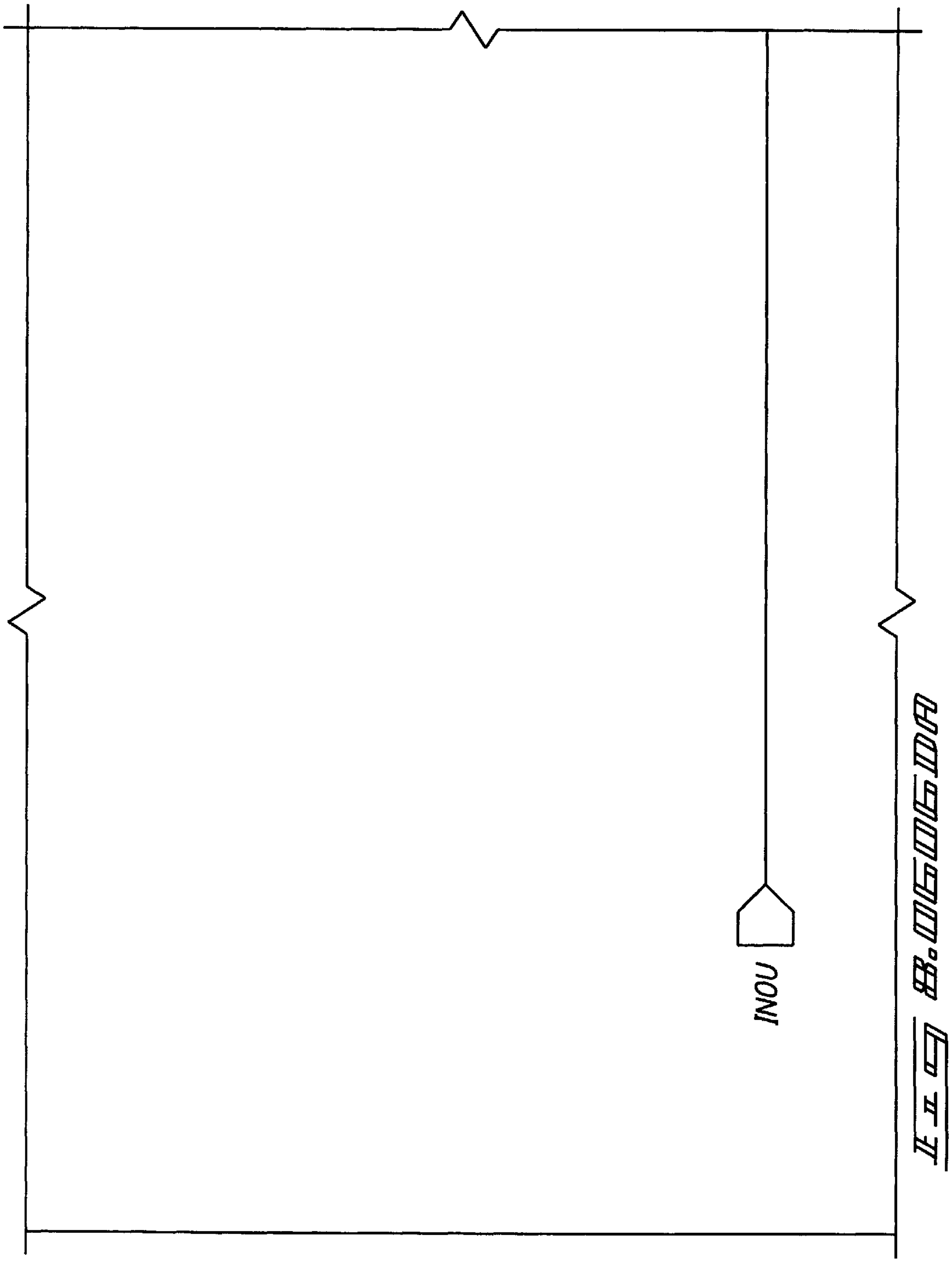
FIG. 8.0606DA

FIG. 8.0606DB

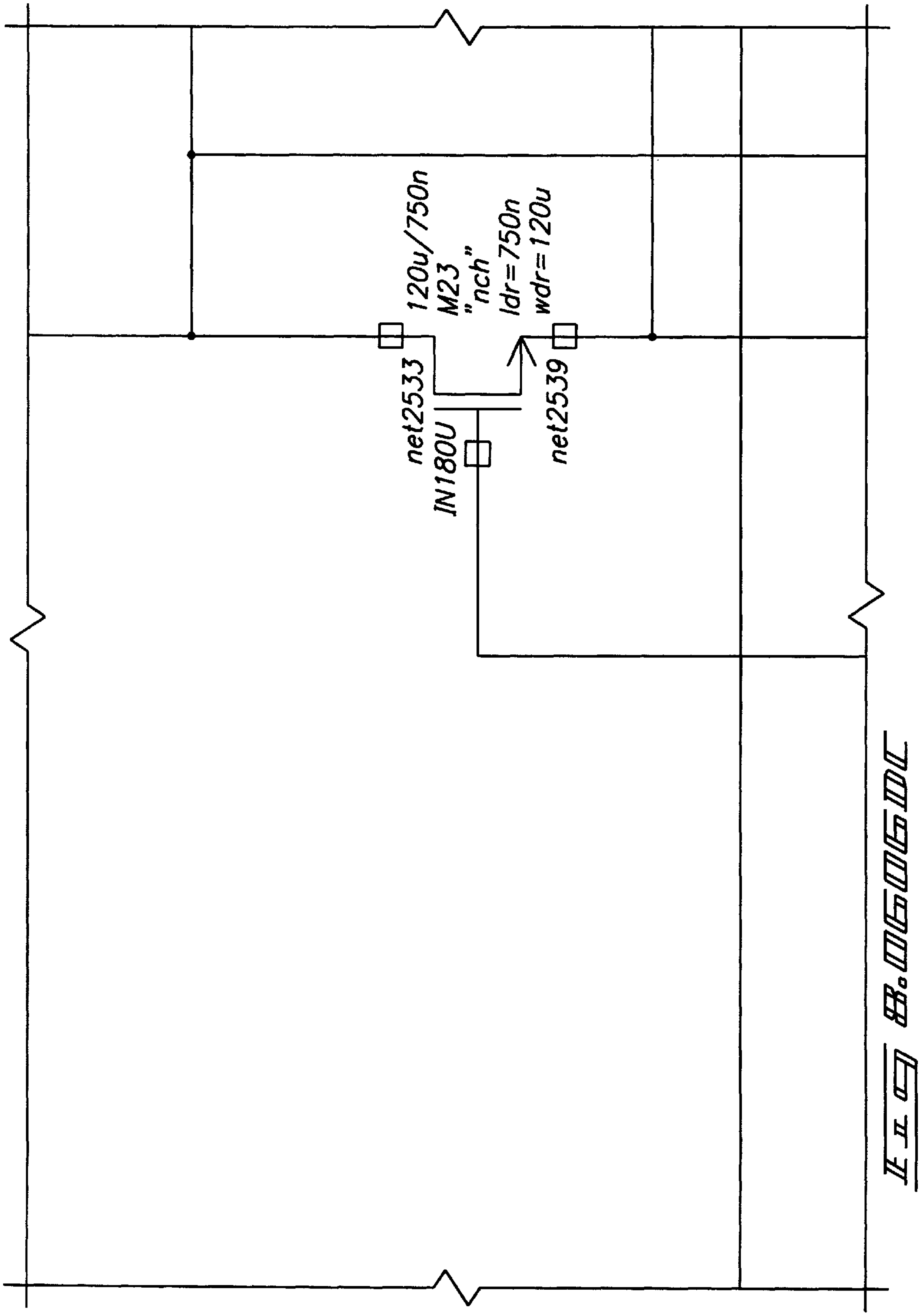
FIG. 8.0606DC

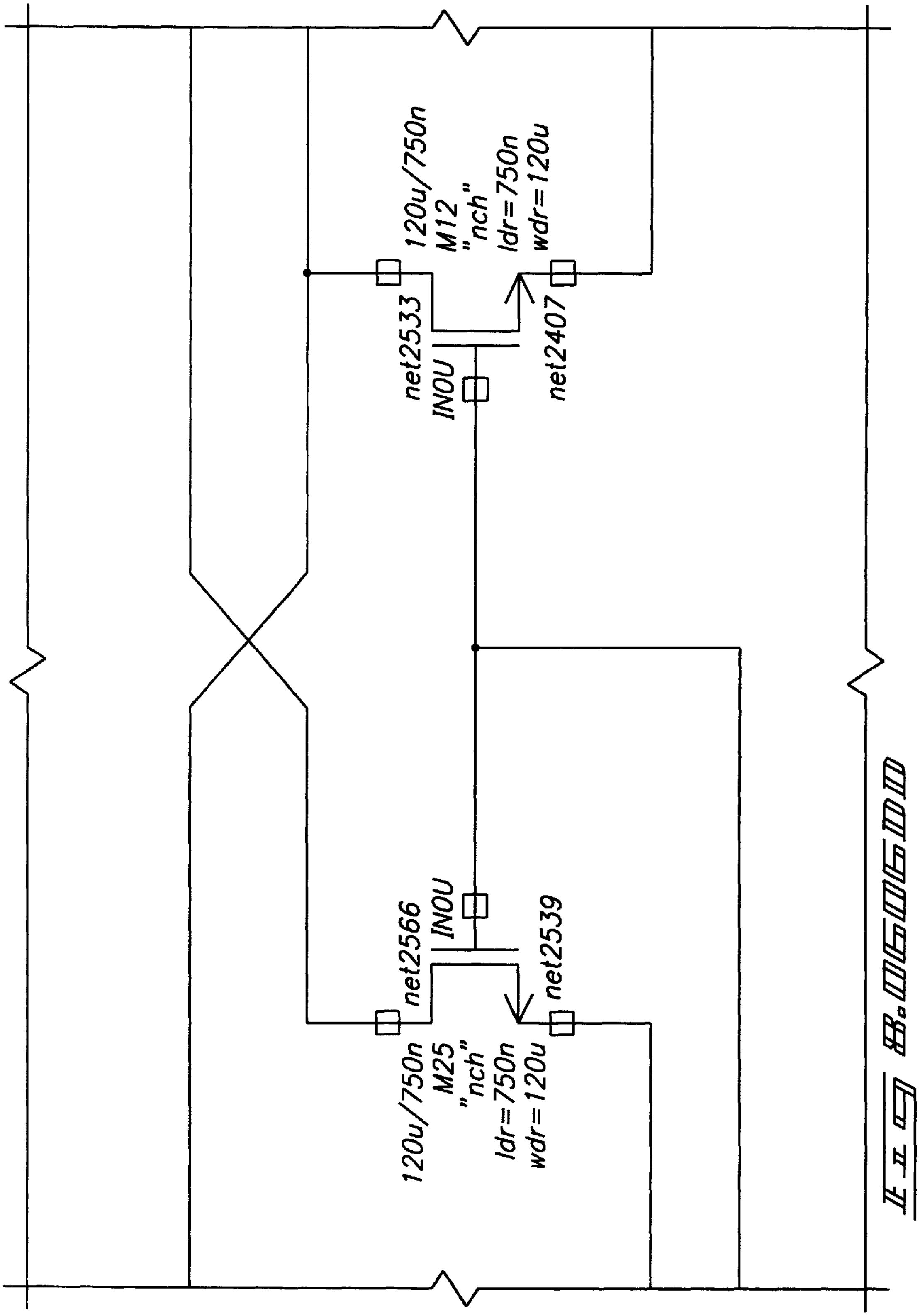
Fig. 8.006DD

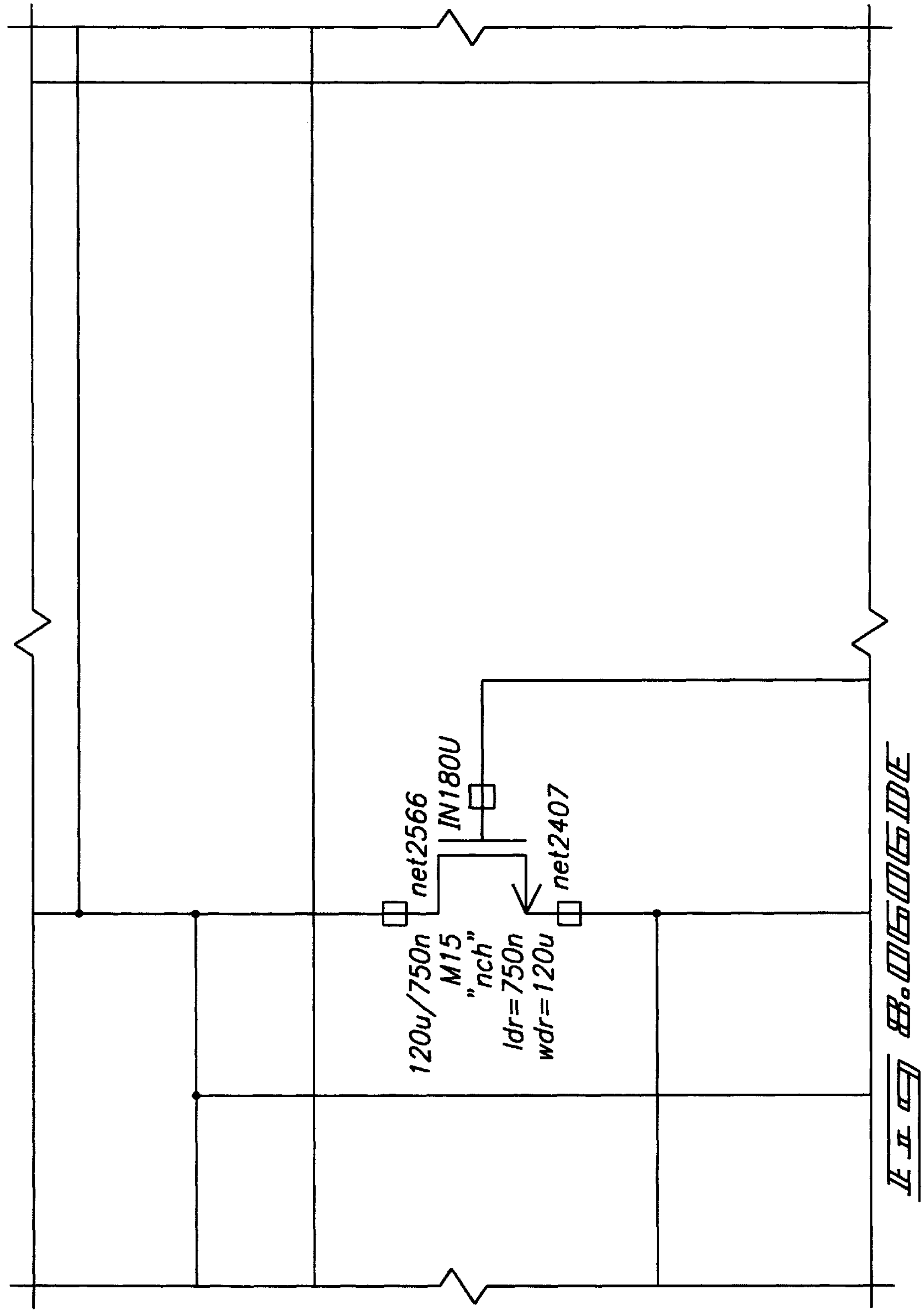
FIG. 8.0606DE

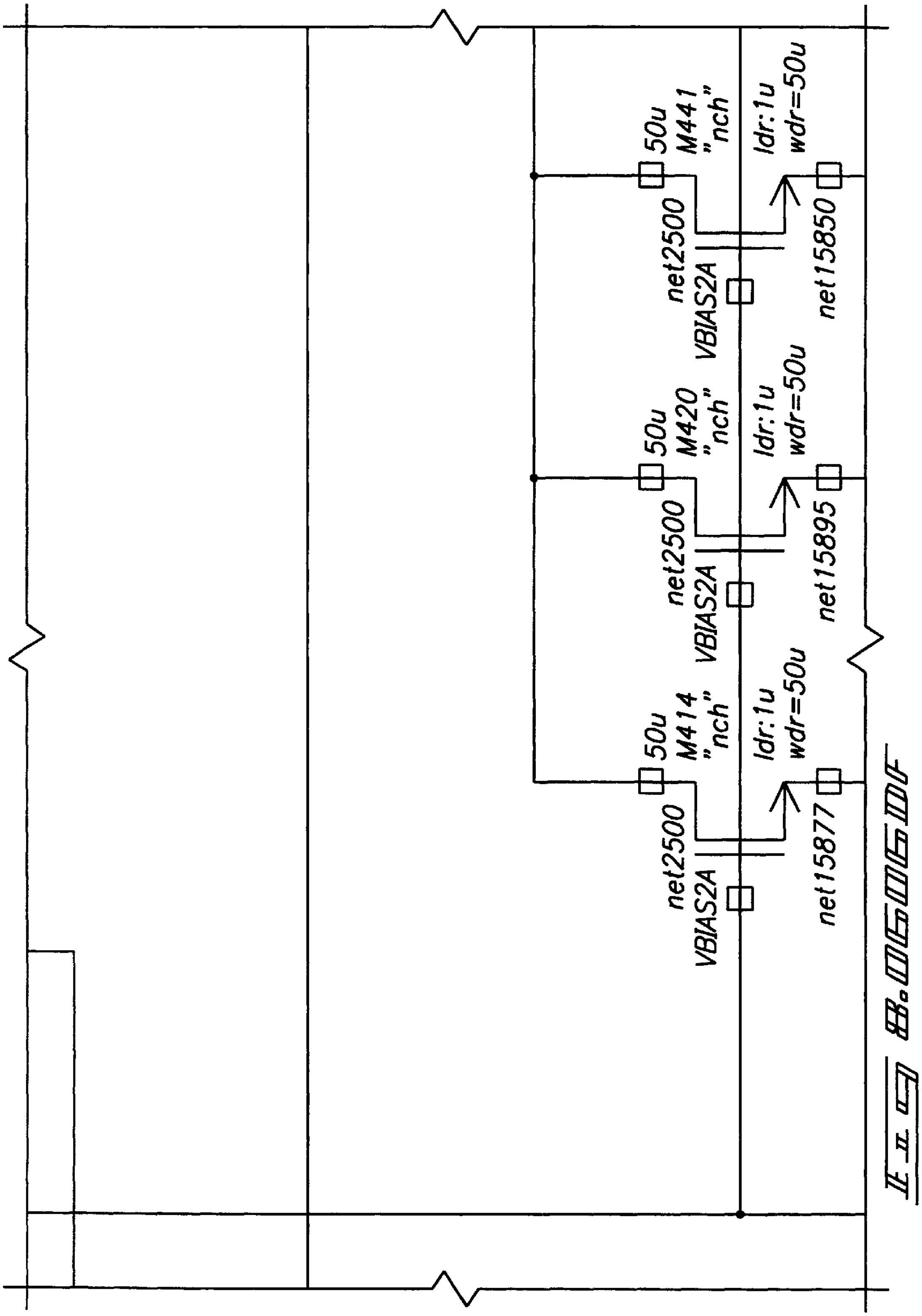
FIG. 8.0056DF

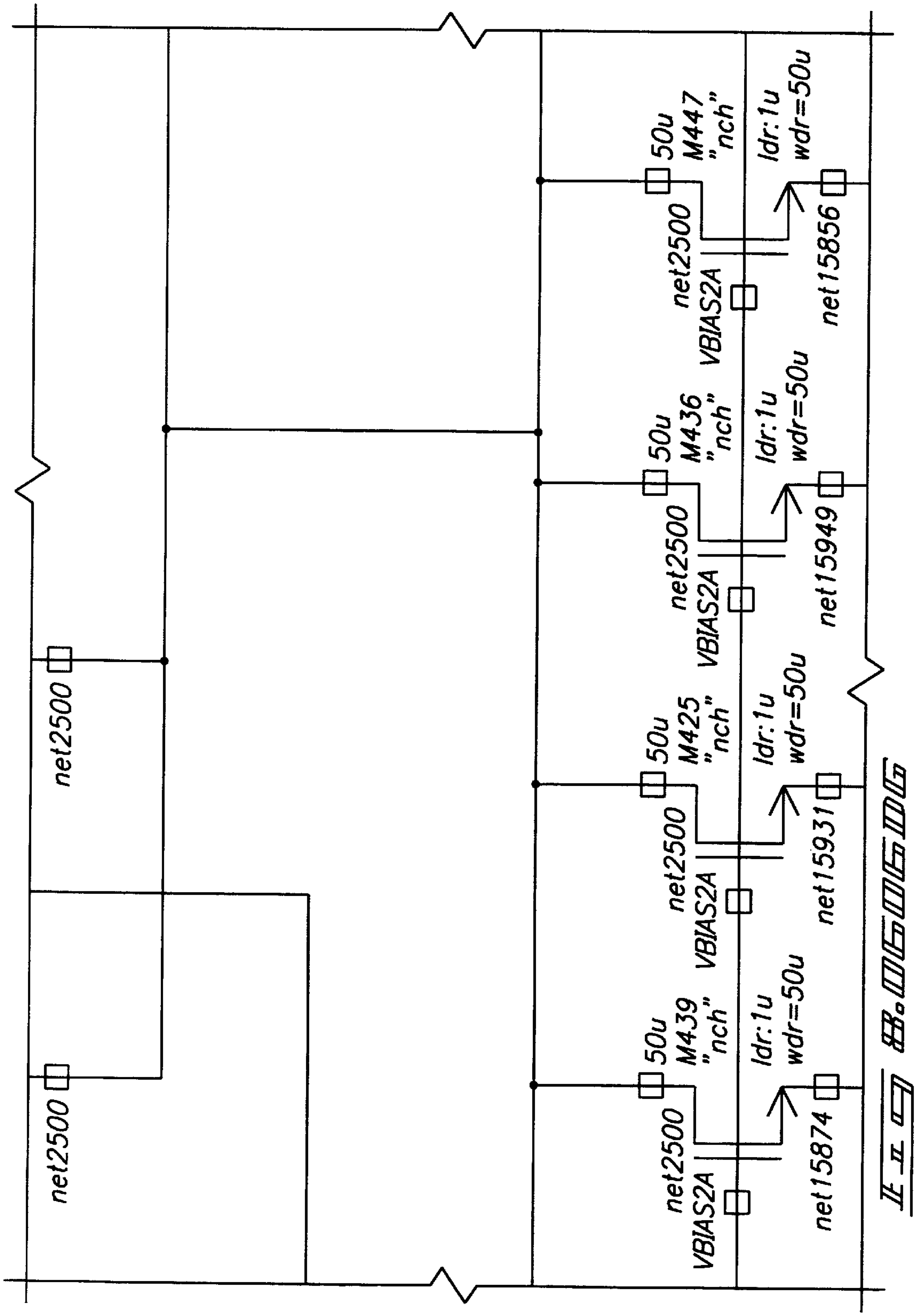
FIG. 8.0060DG

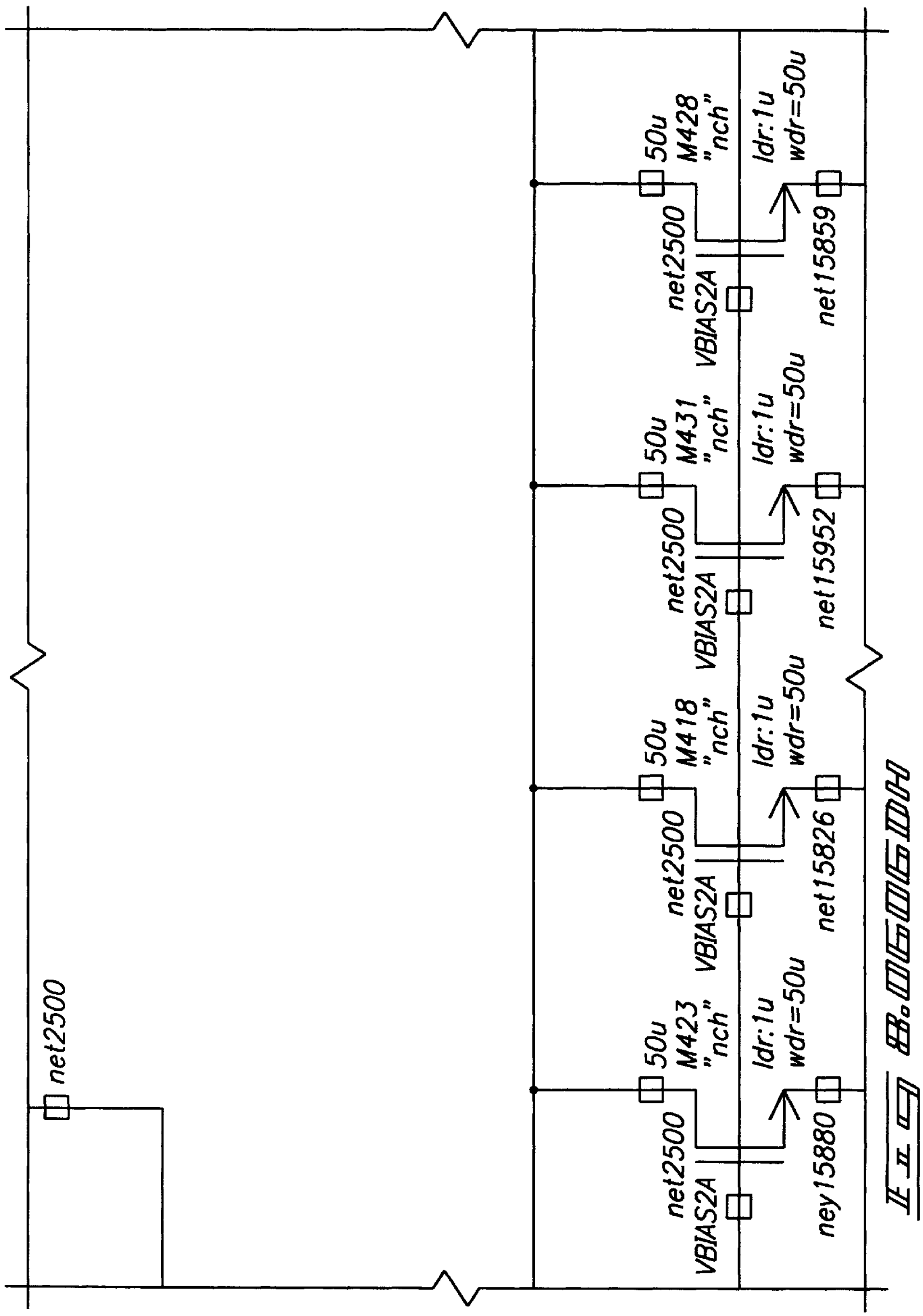
Fig. 8.0060H

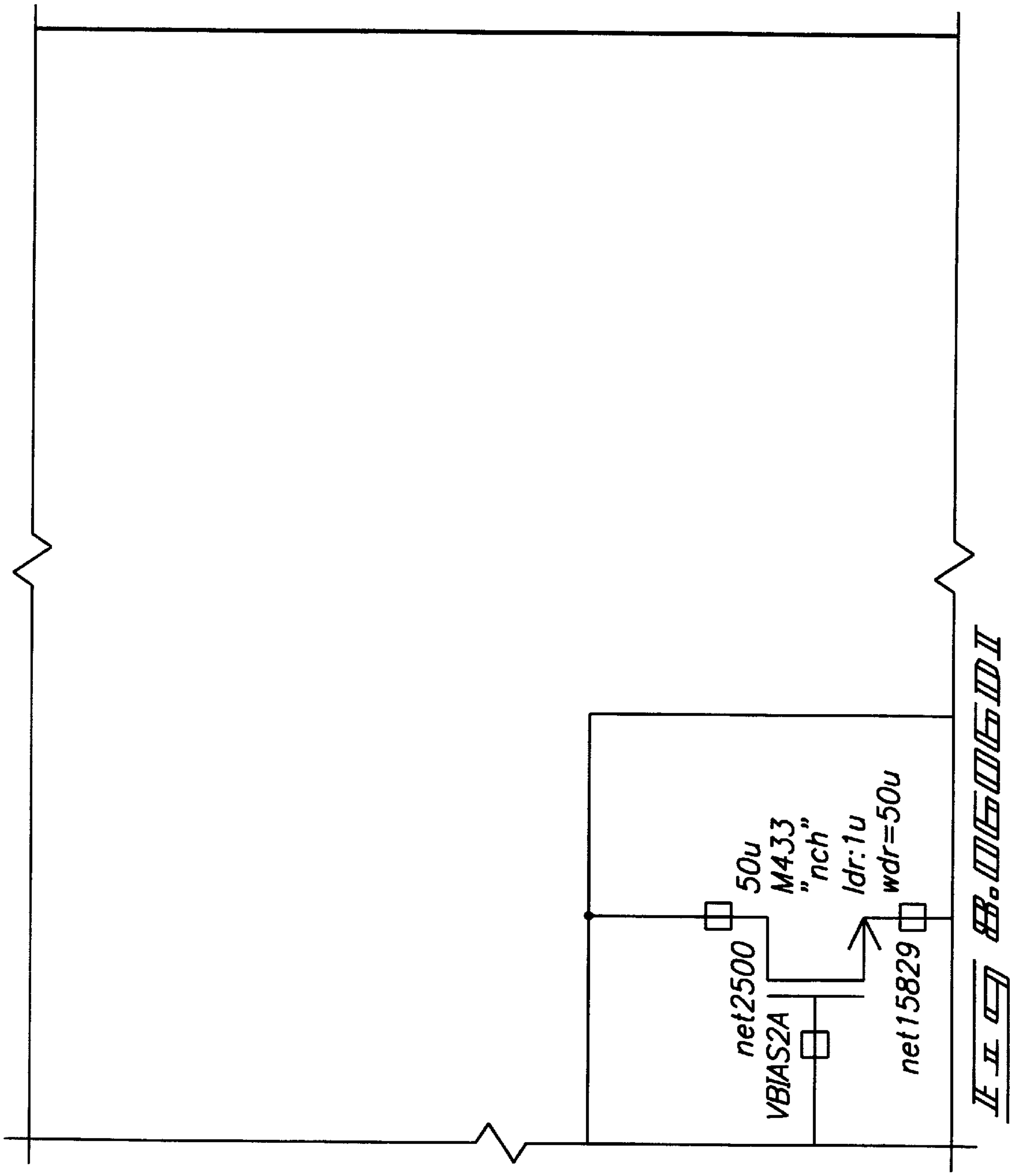
FIG. 8.006DI

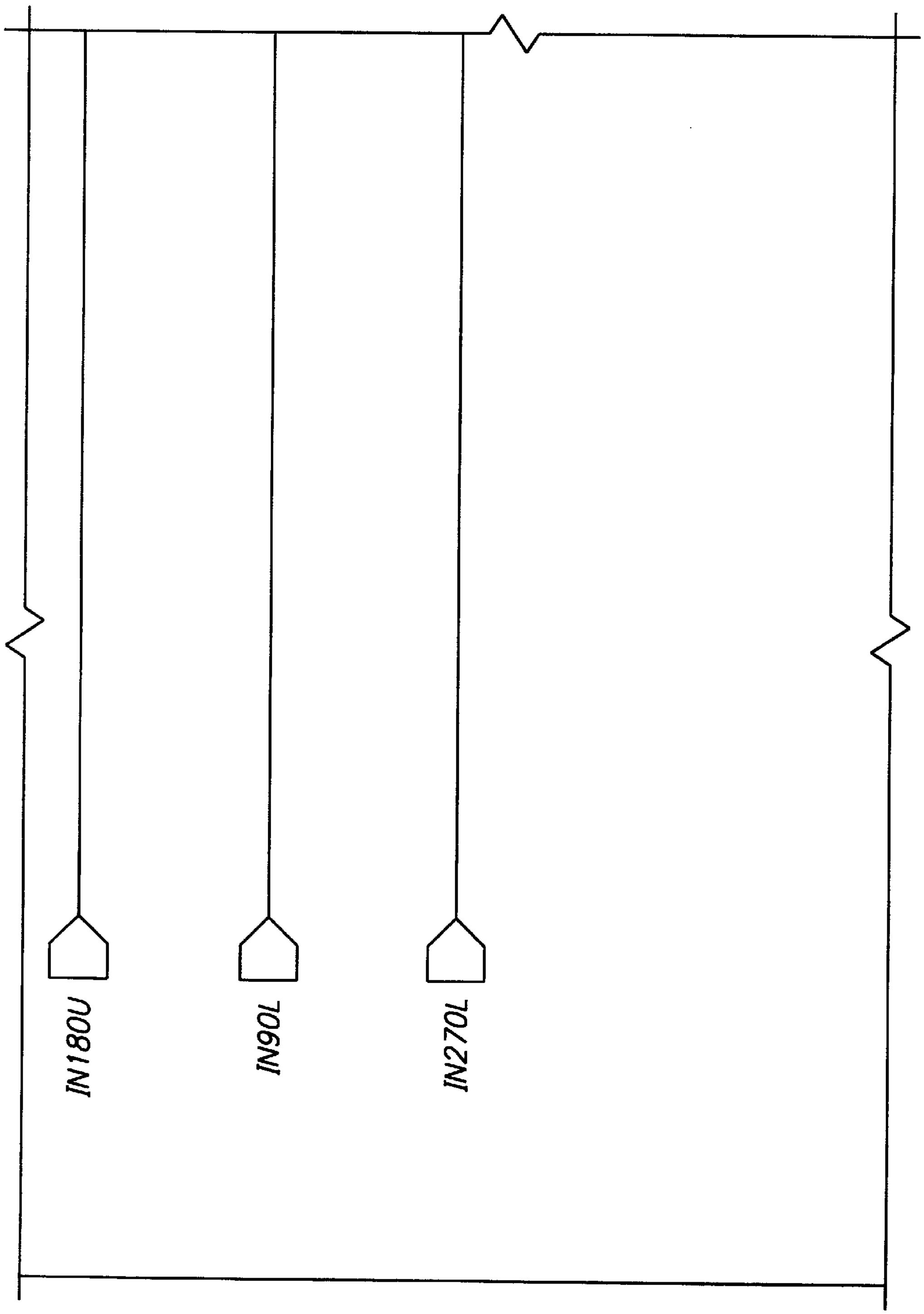
Fig. 8.06G6EA

FIG. 8.0606E-B

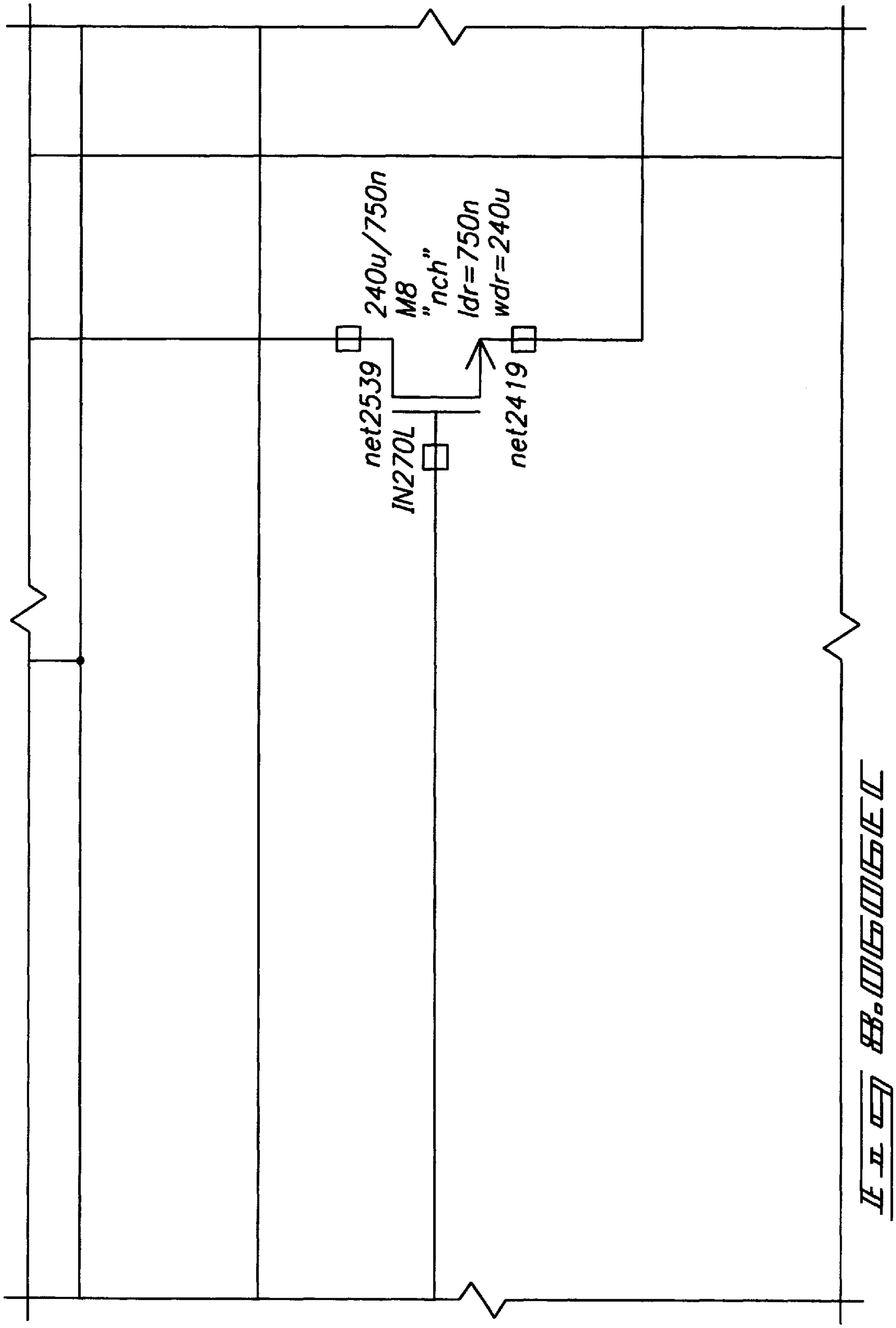
FIG. 8.0606EC

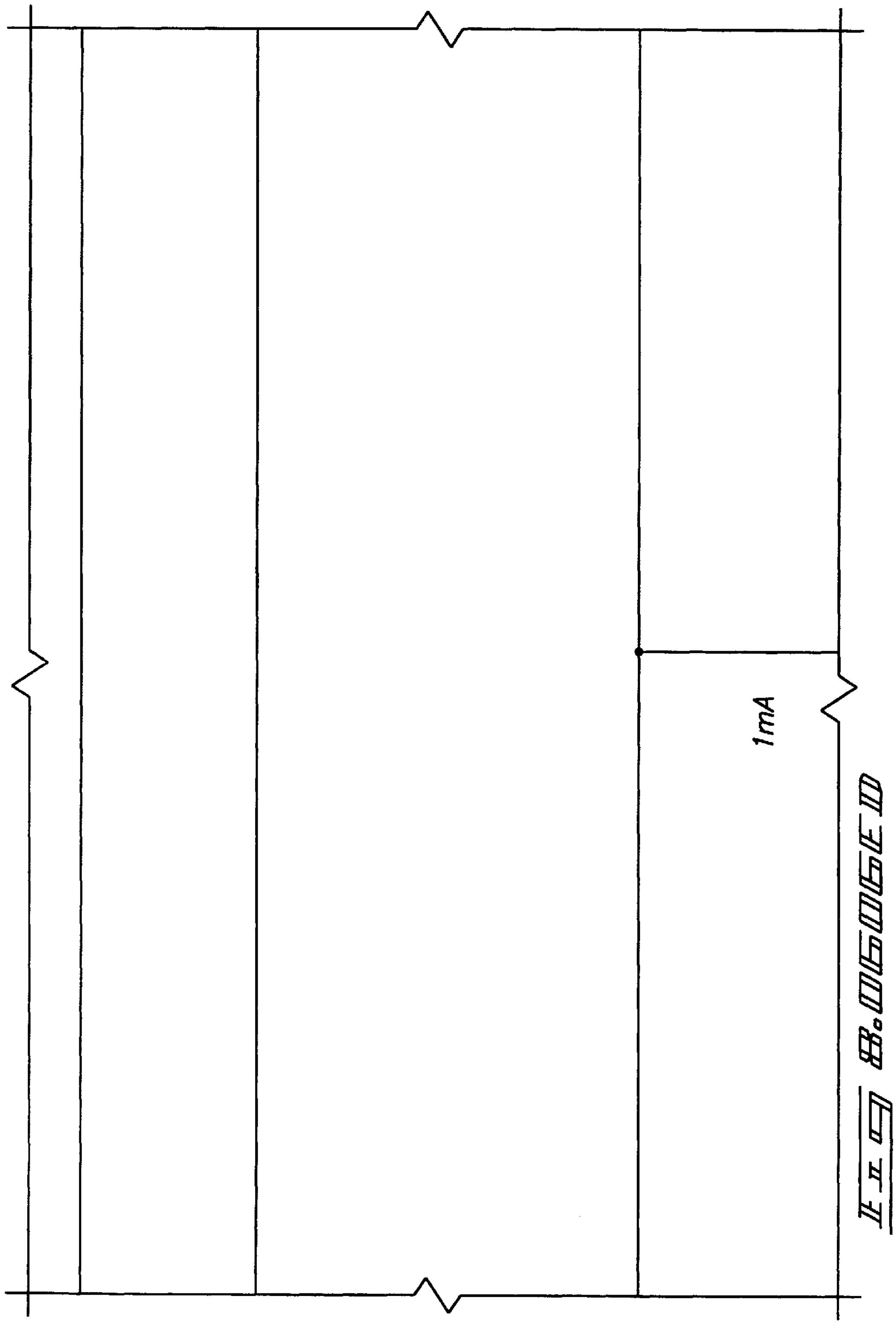
FIG. 8.0606ED

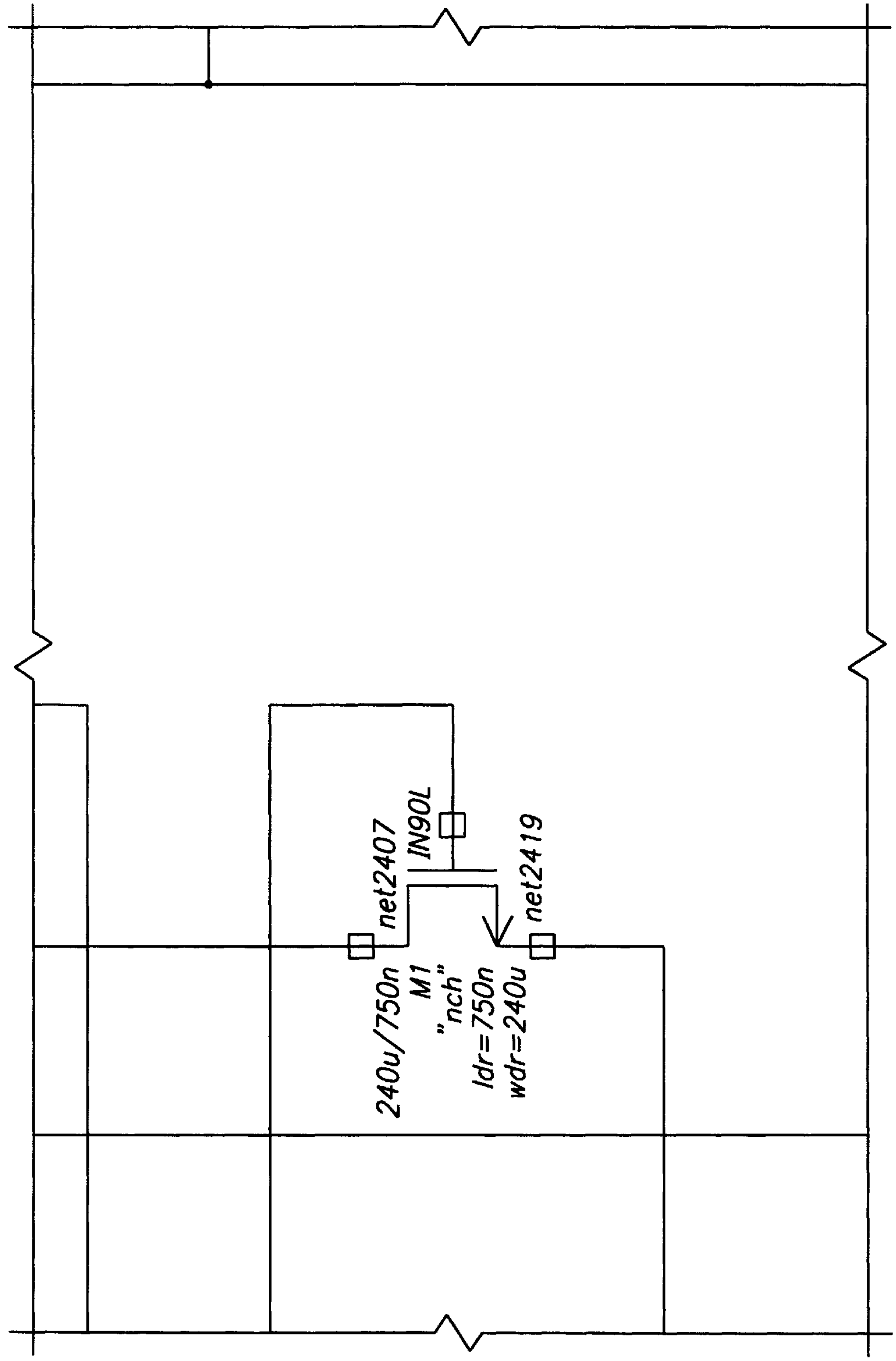
Fig. 8.0606EE

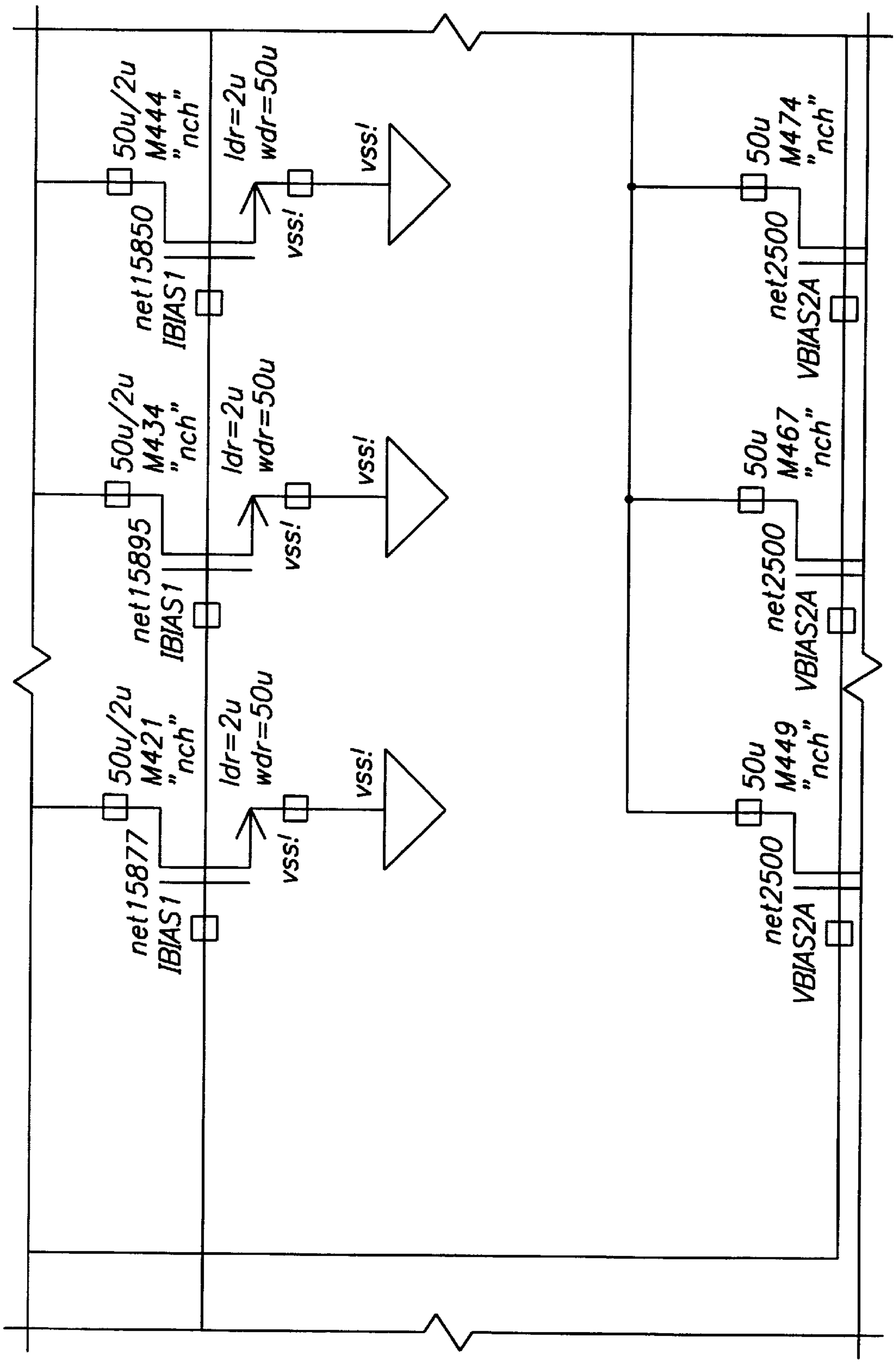
FIG. 8.006EF

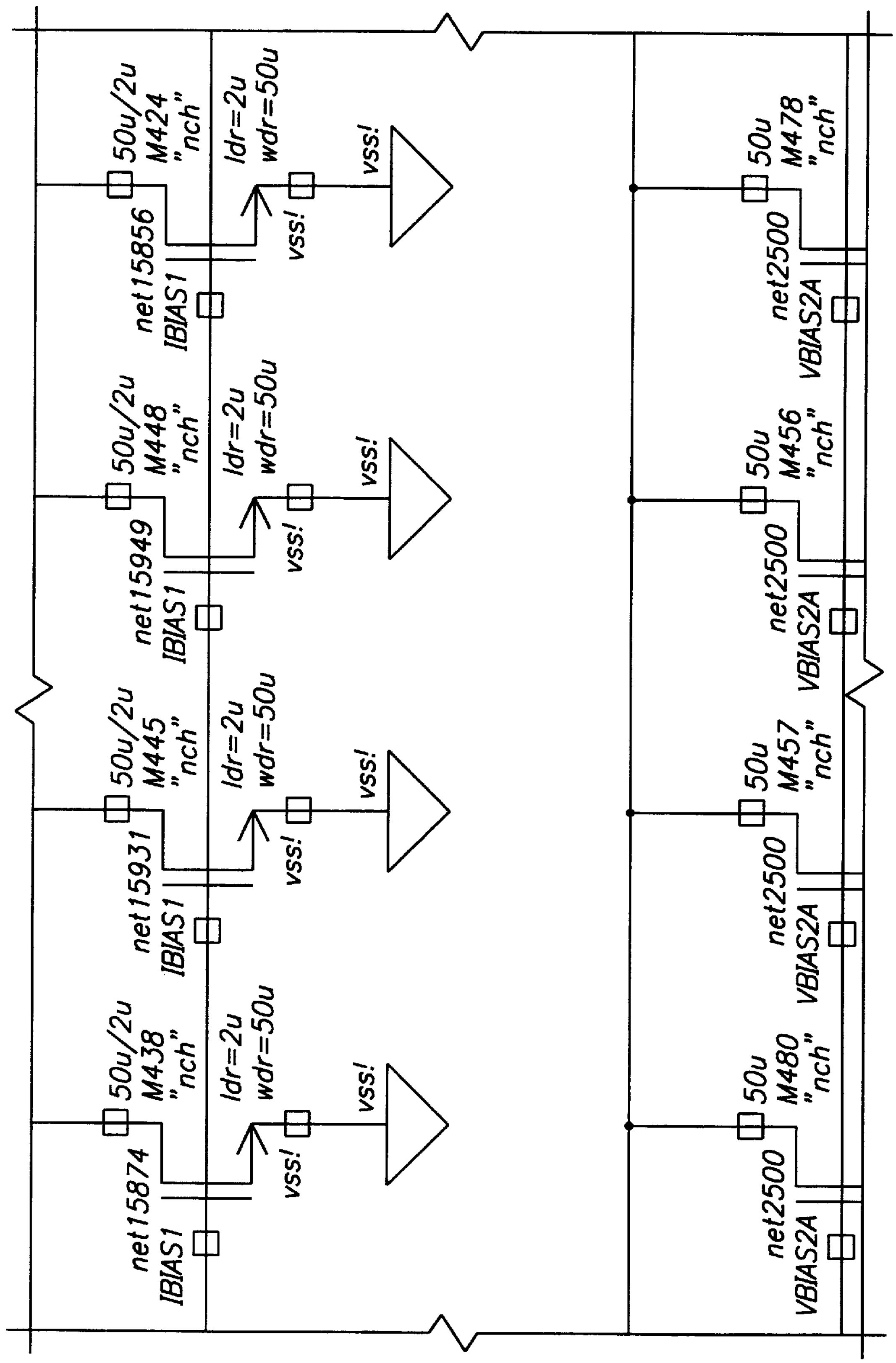
Fig. 8.006EG

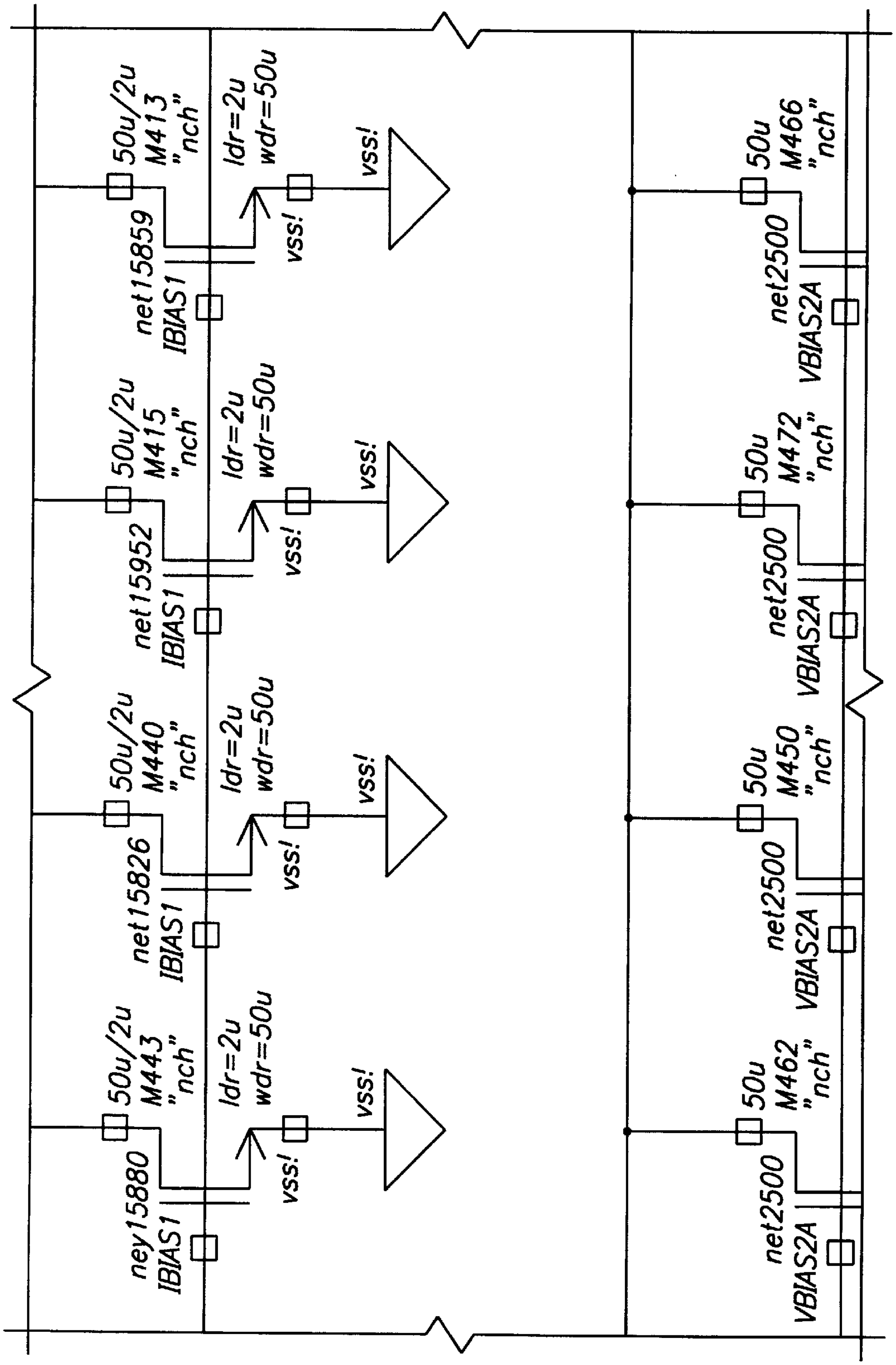
FIG. 8.00GGEH

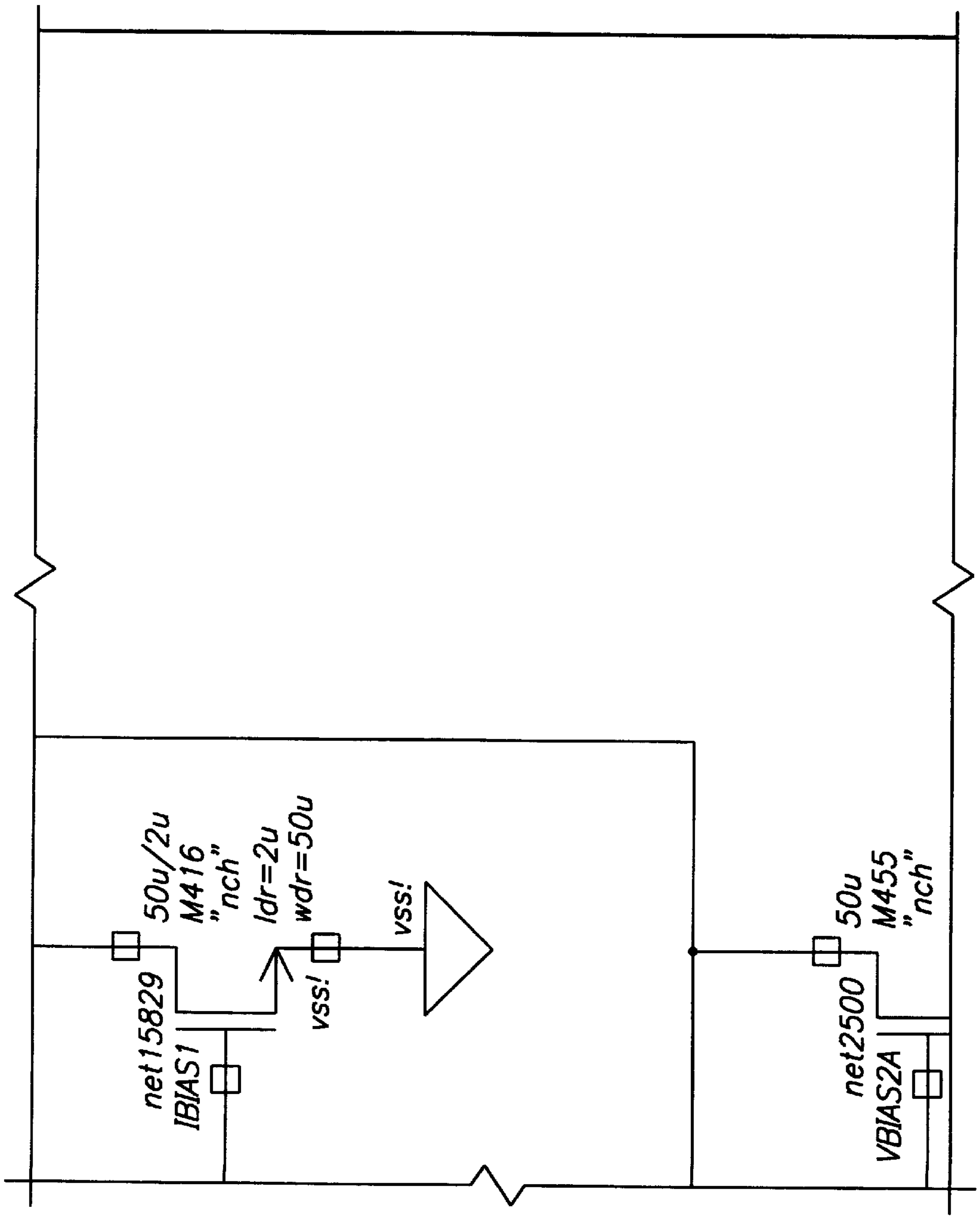
Fig. 8.006EI

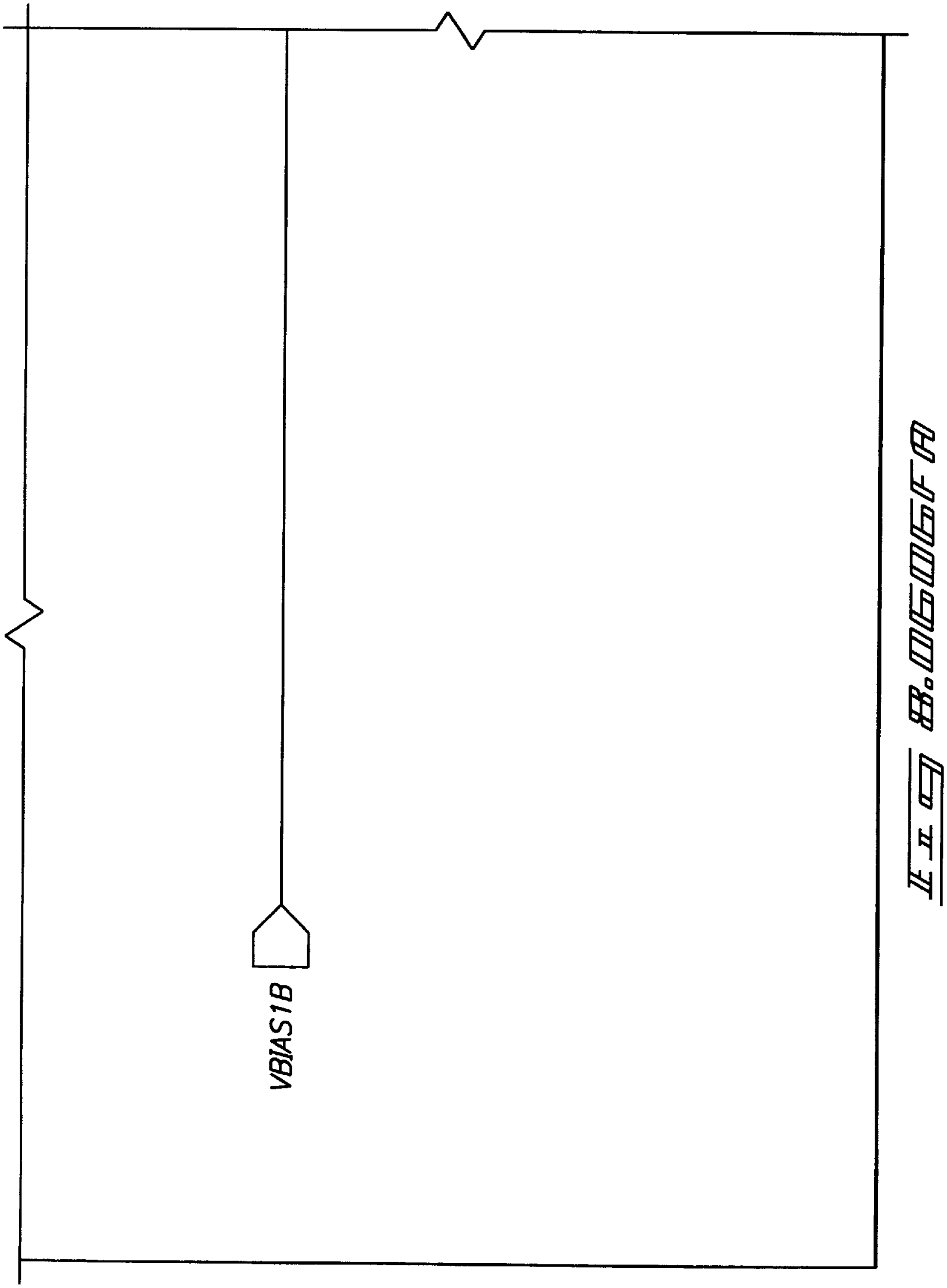
FIG. 8.006FA

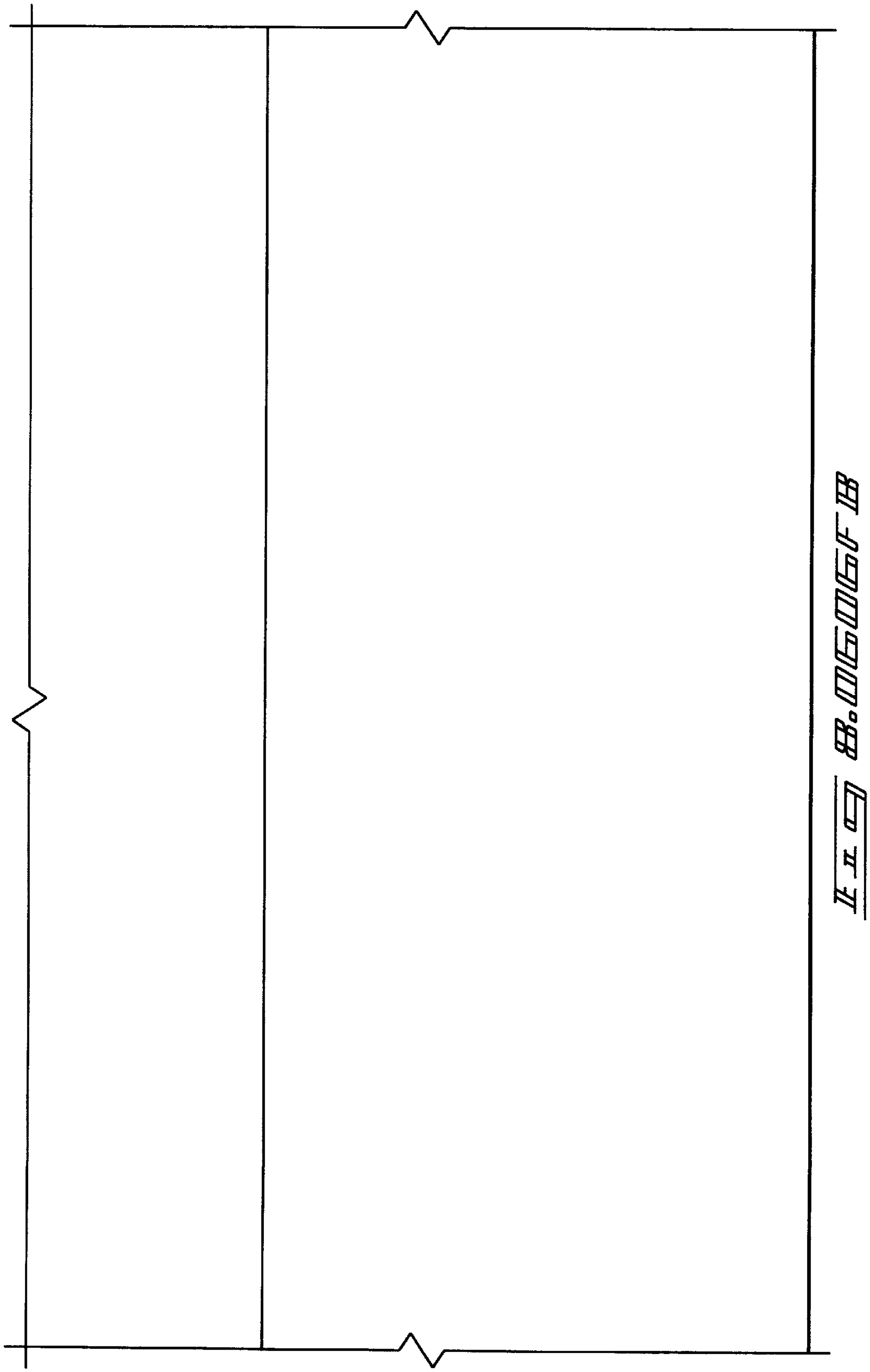
Fig. 8.0606F1B

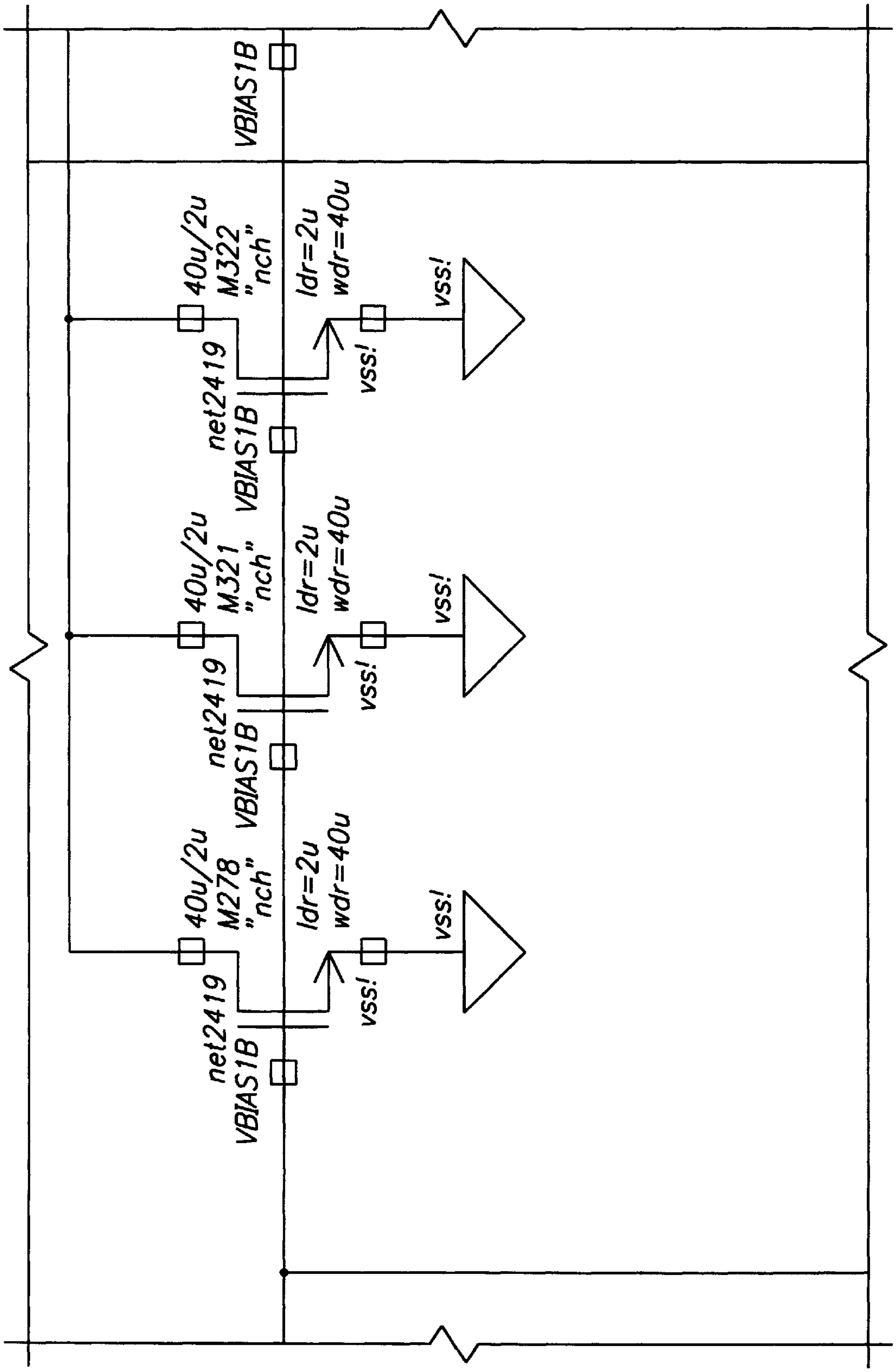
Fig. 8.006FC

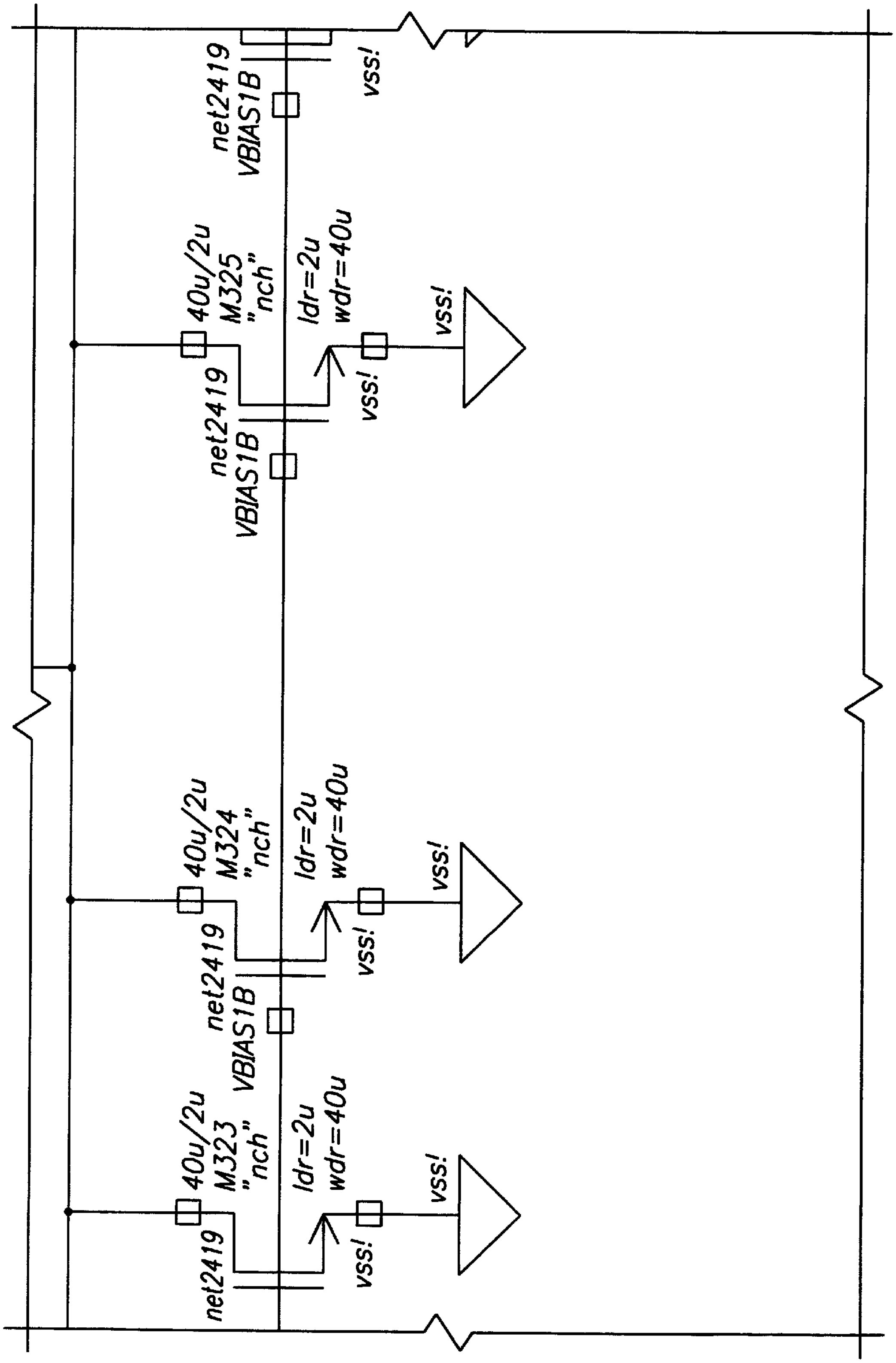
Fig. 8.0606FD

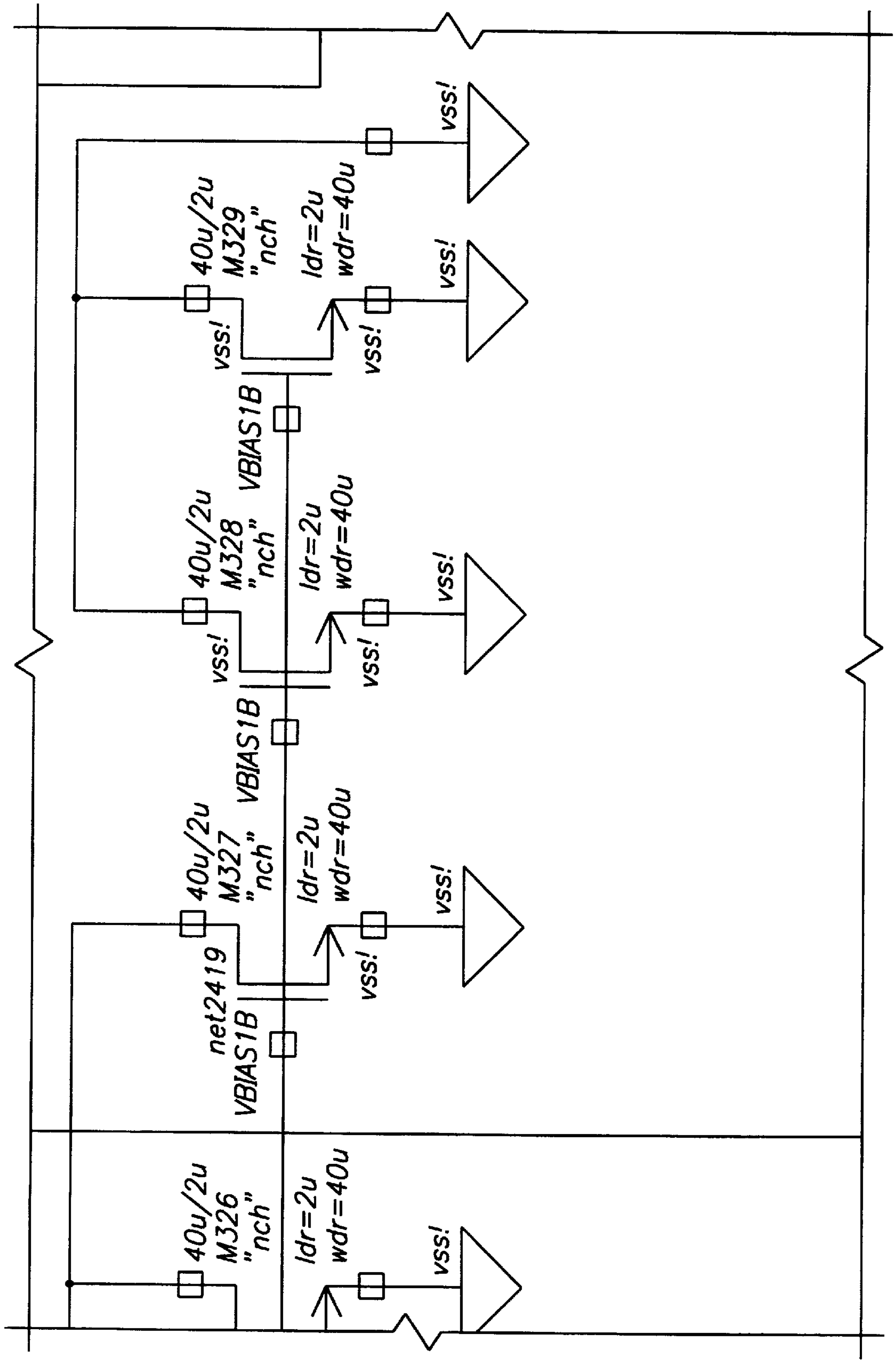
FIG. 8.06G6FE

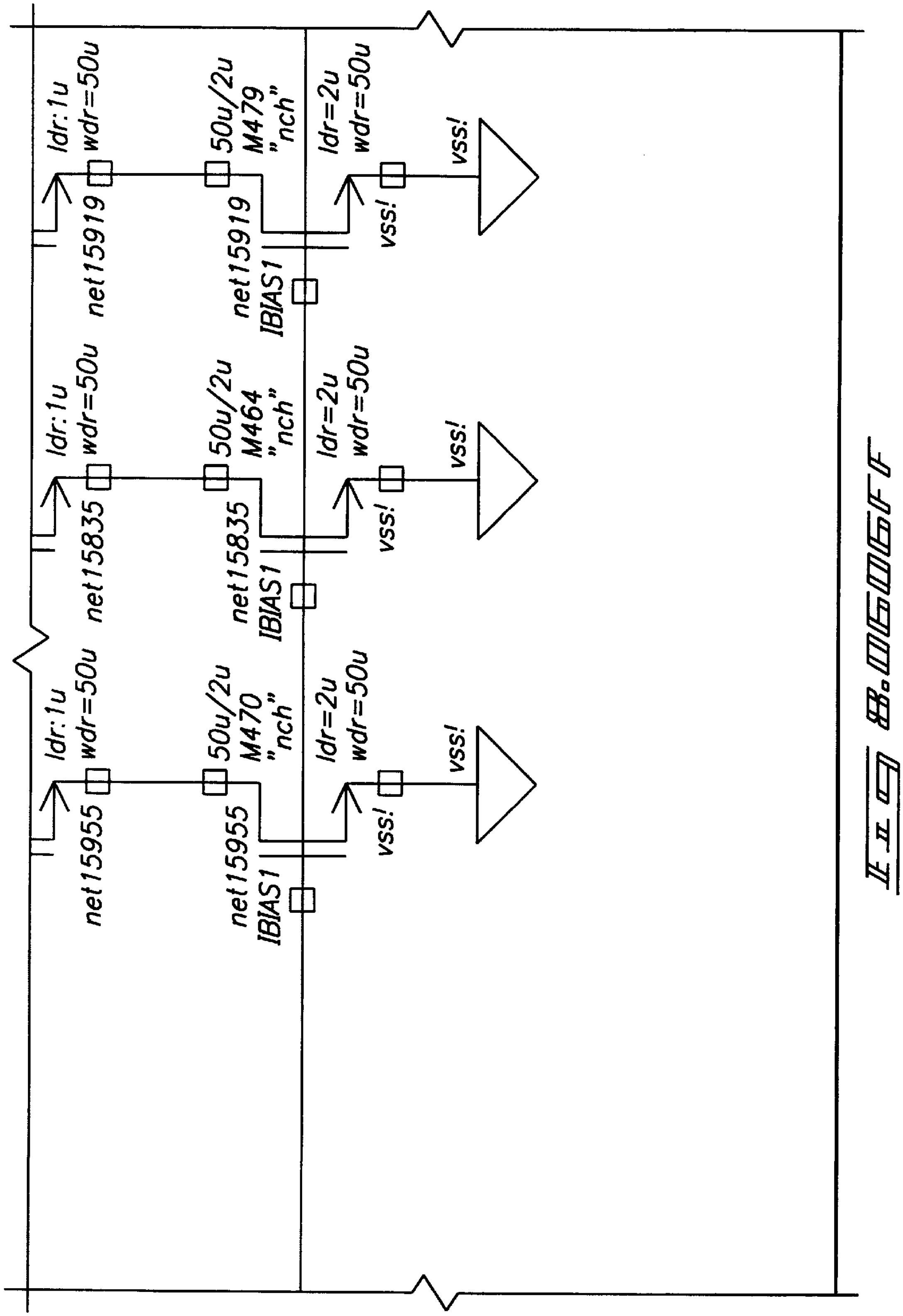
Fig. 8.06GFF

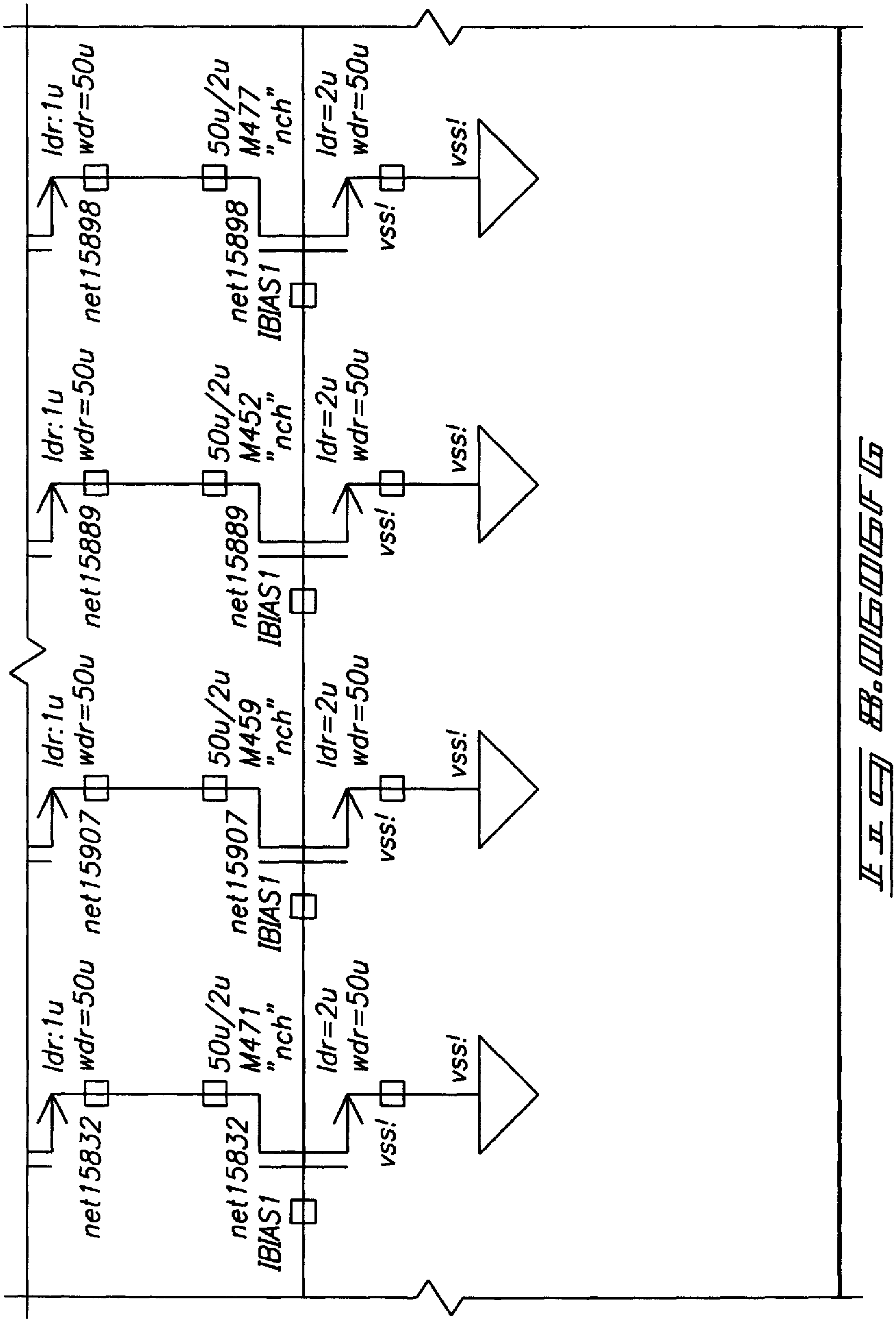
FIG. 8.006FG

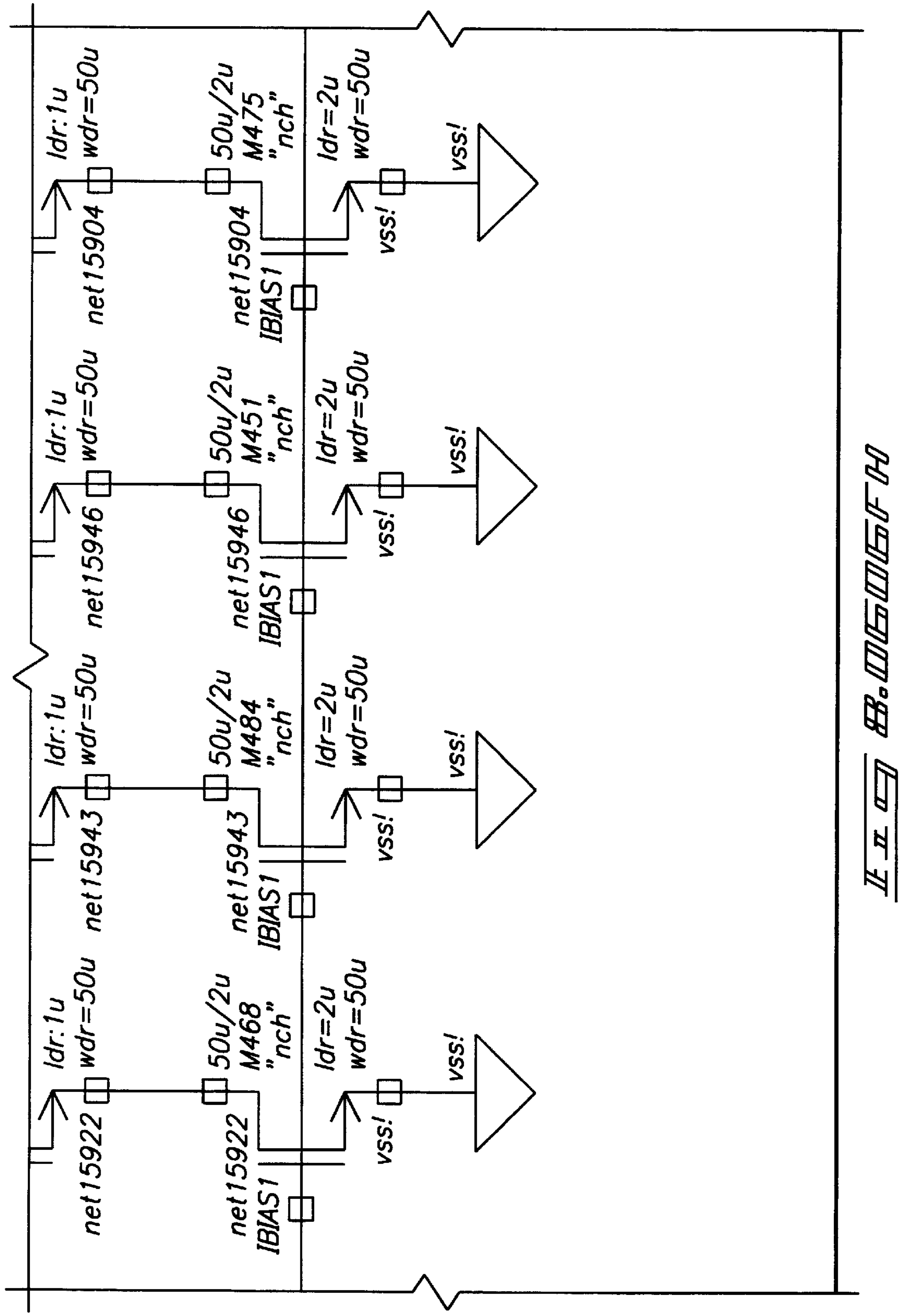
FIG. 8.0606H

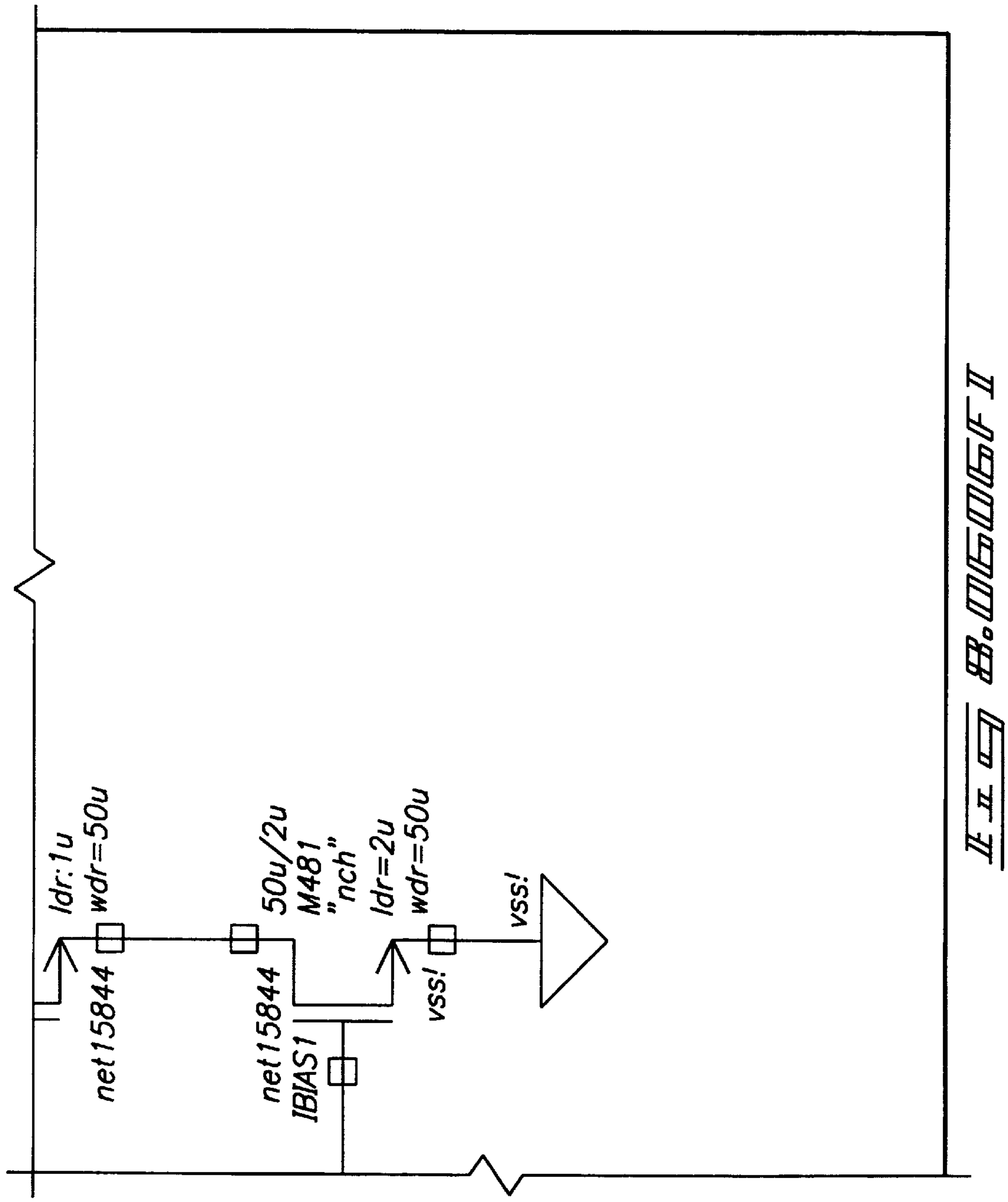
FIG. 8.006FI

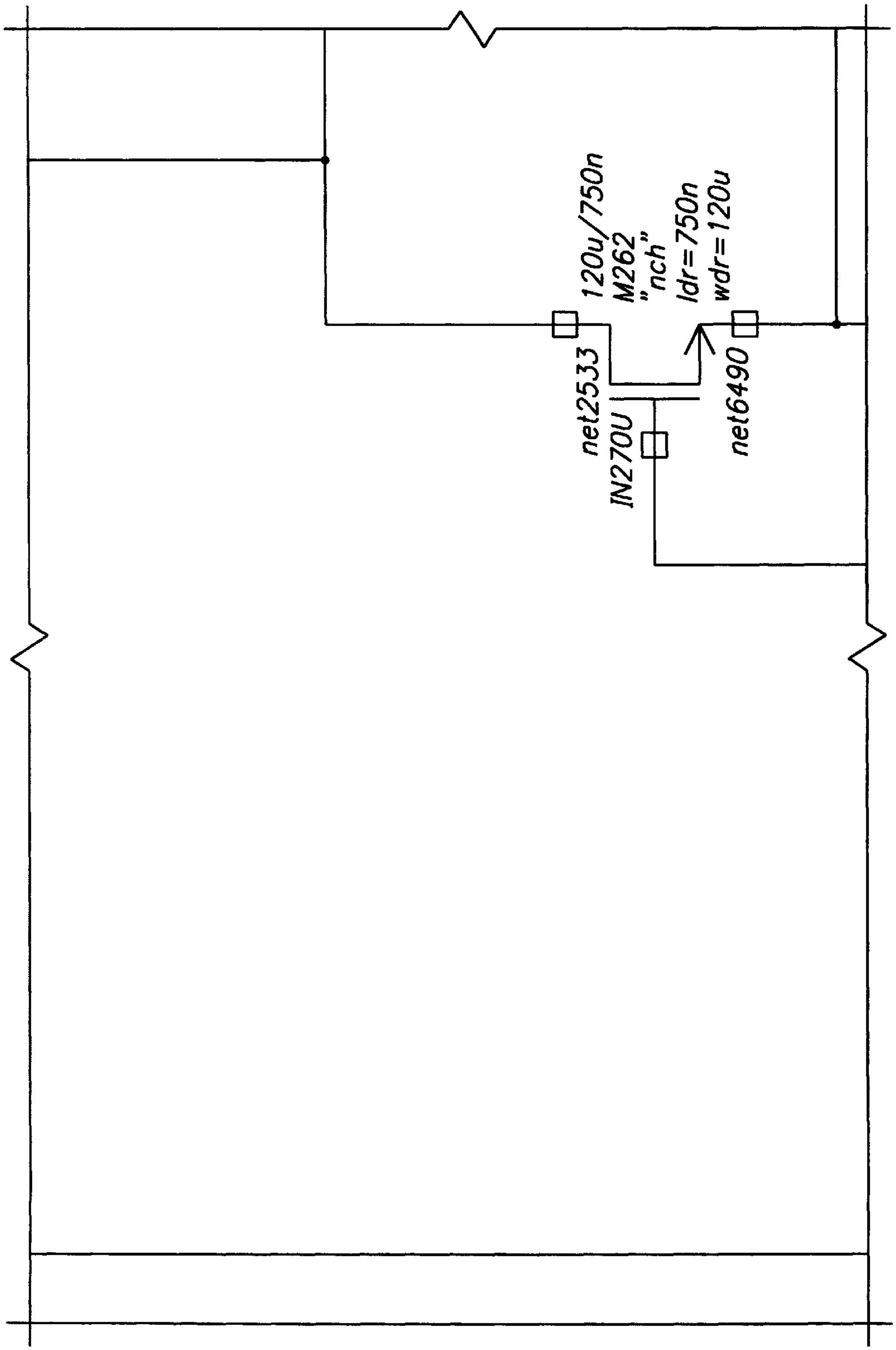
Fig. 8.066GL

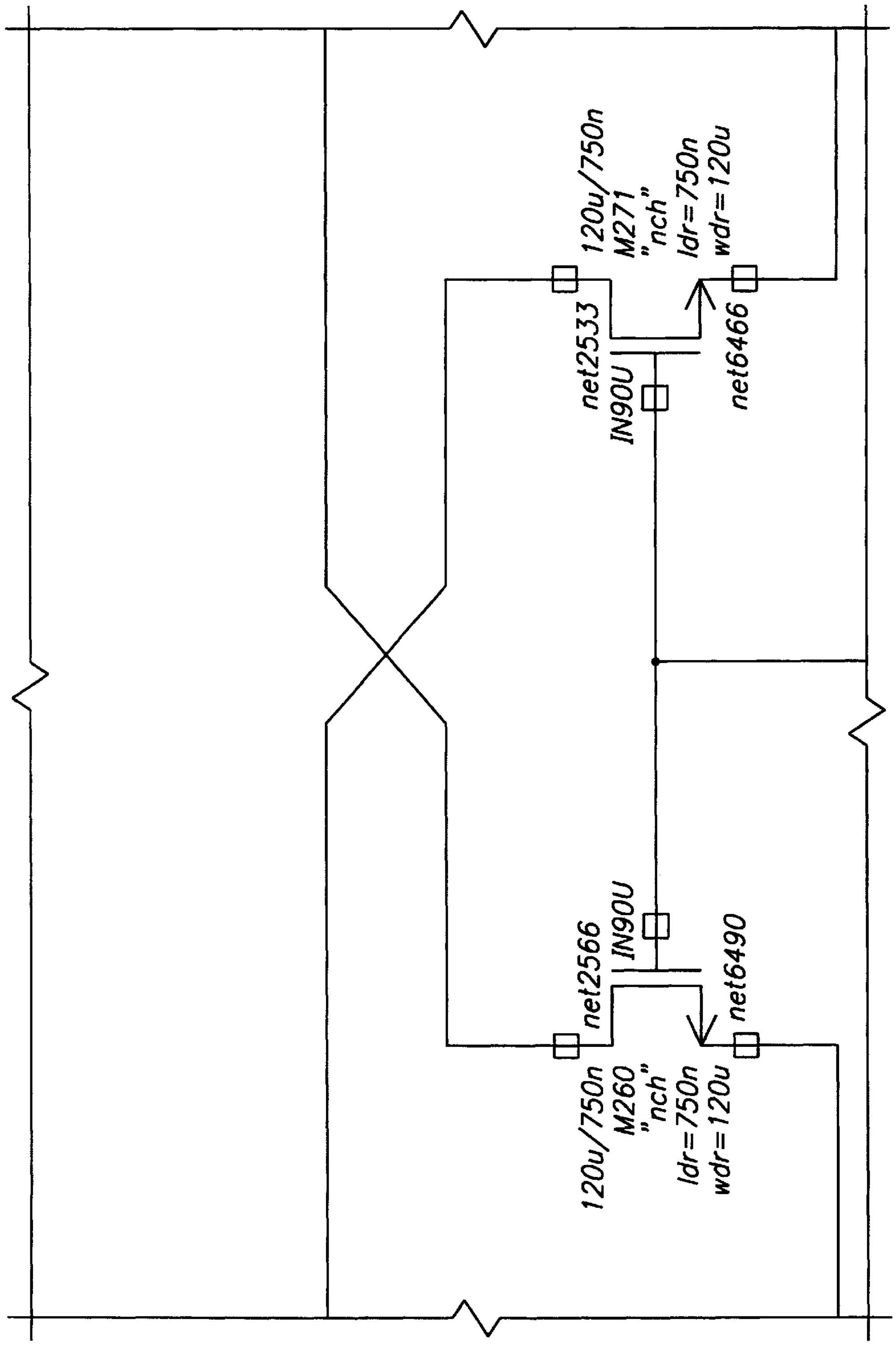
Fig. 8.006GD

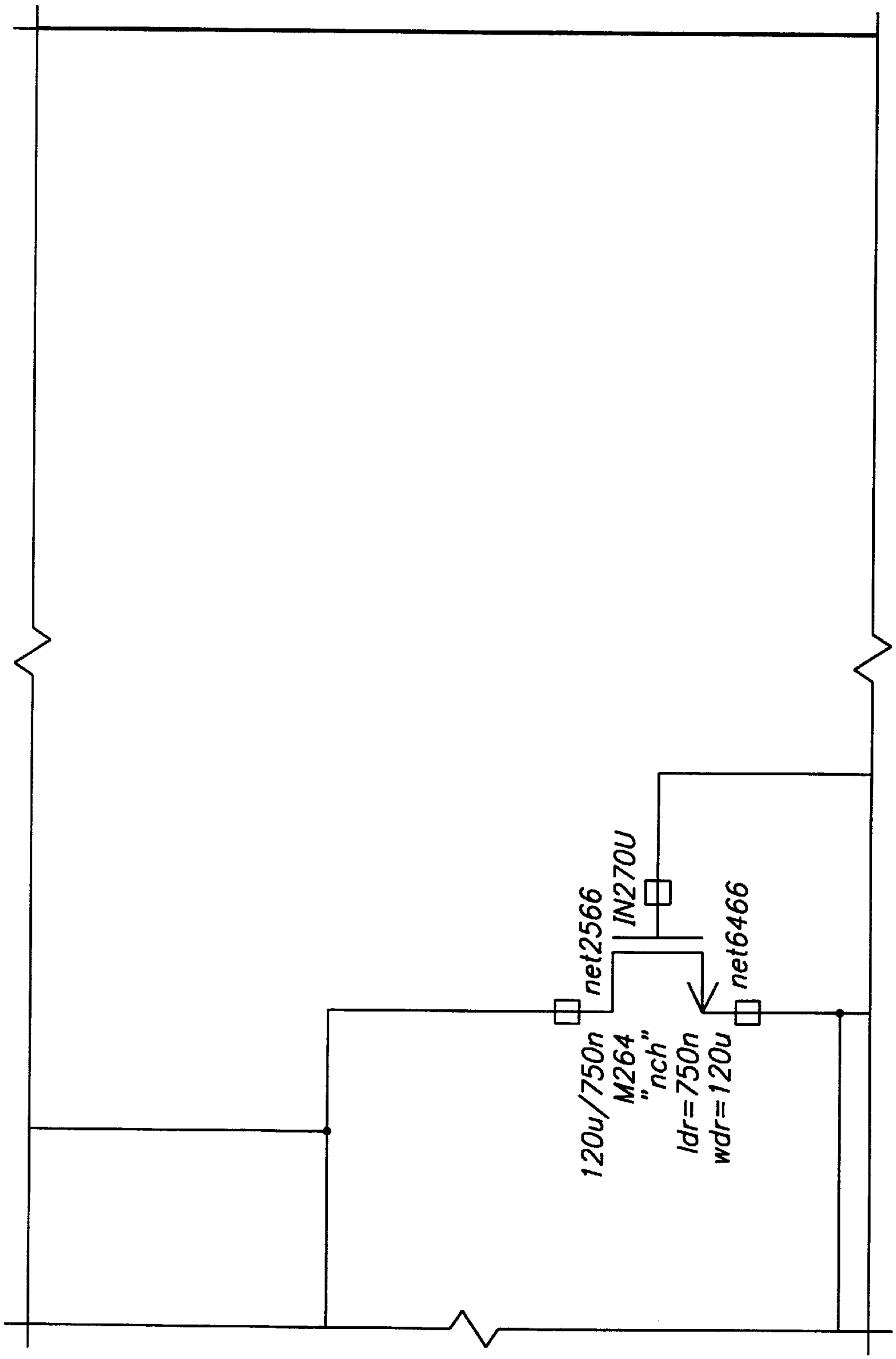
FIG. 8.006GE

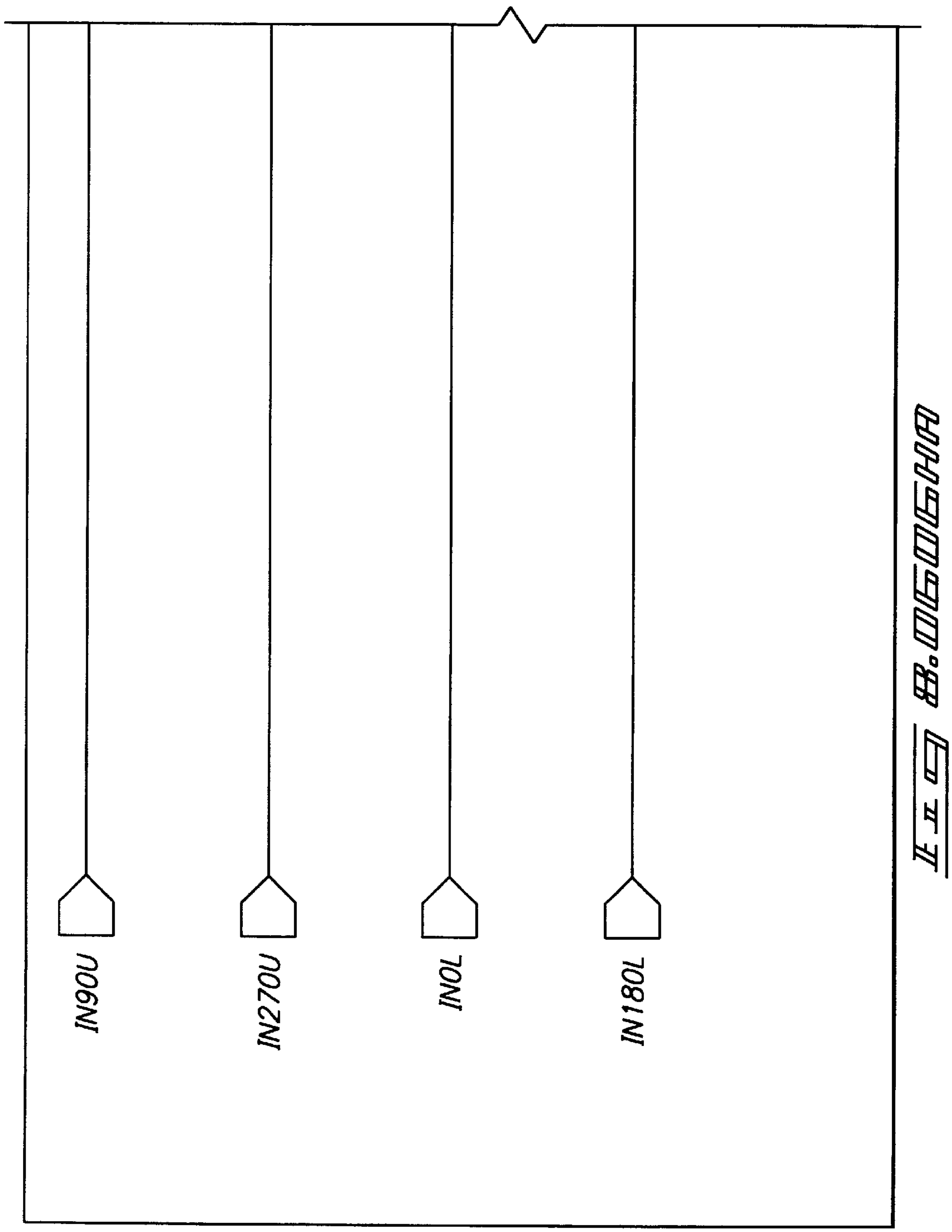
FIG. 8.0606HA

FIG. 8.0G0GHB

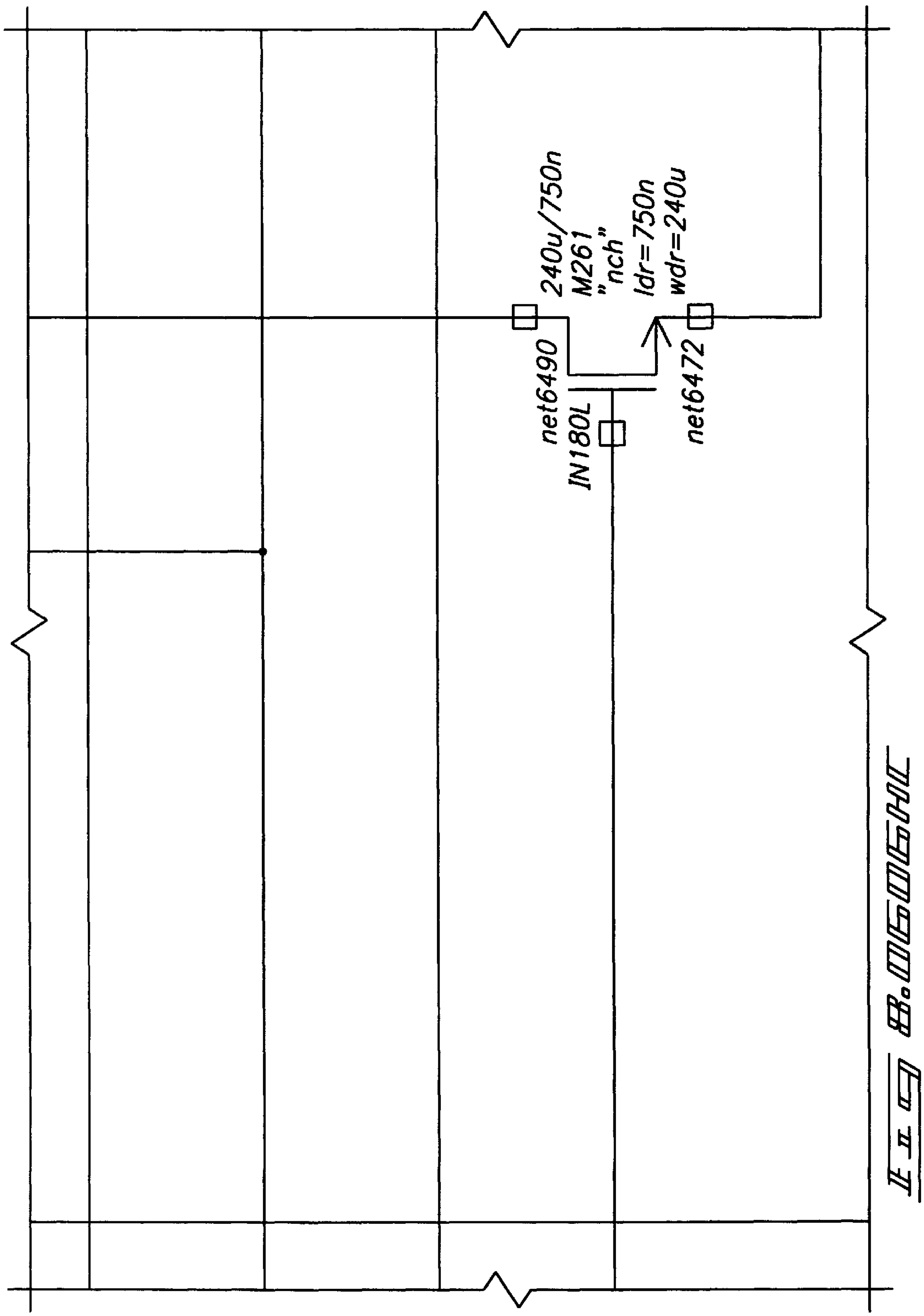
Fig 8.006GHC

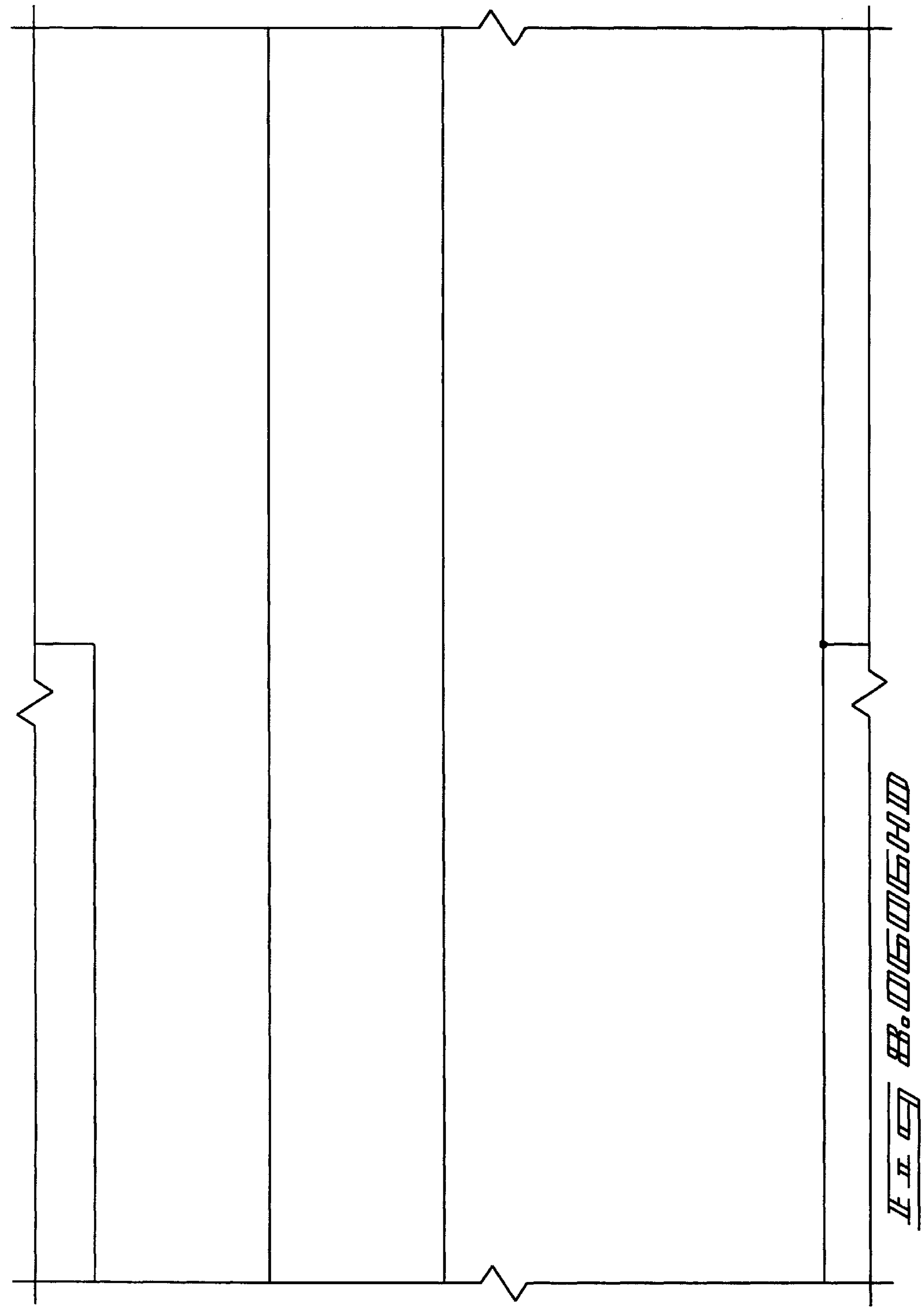
FIG. 8.060640

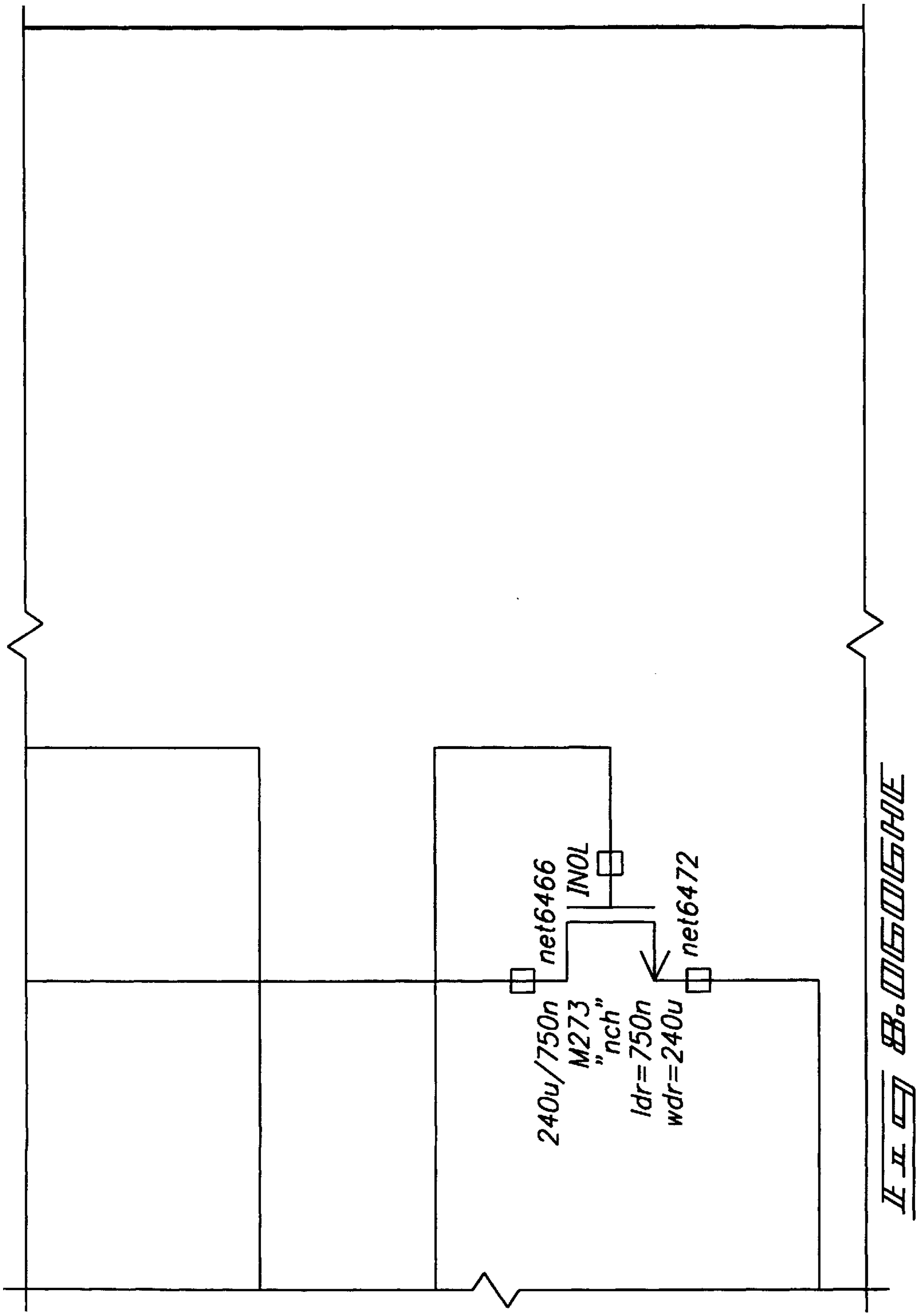
Fig. 8.106GHE

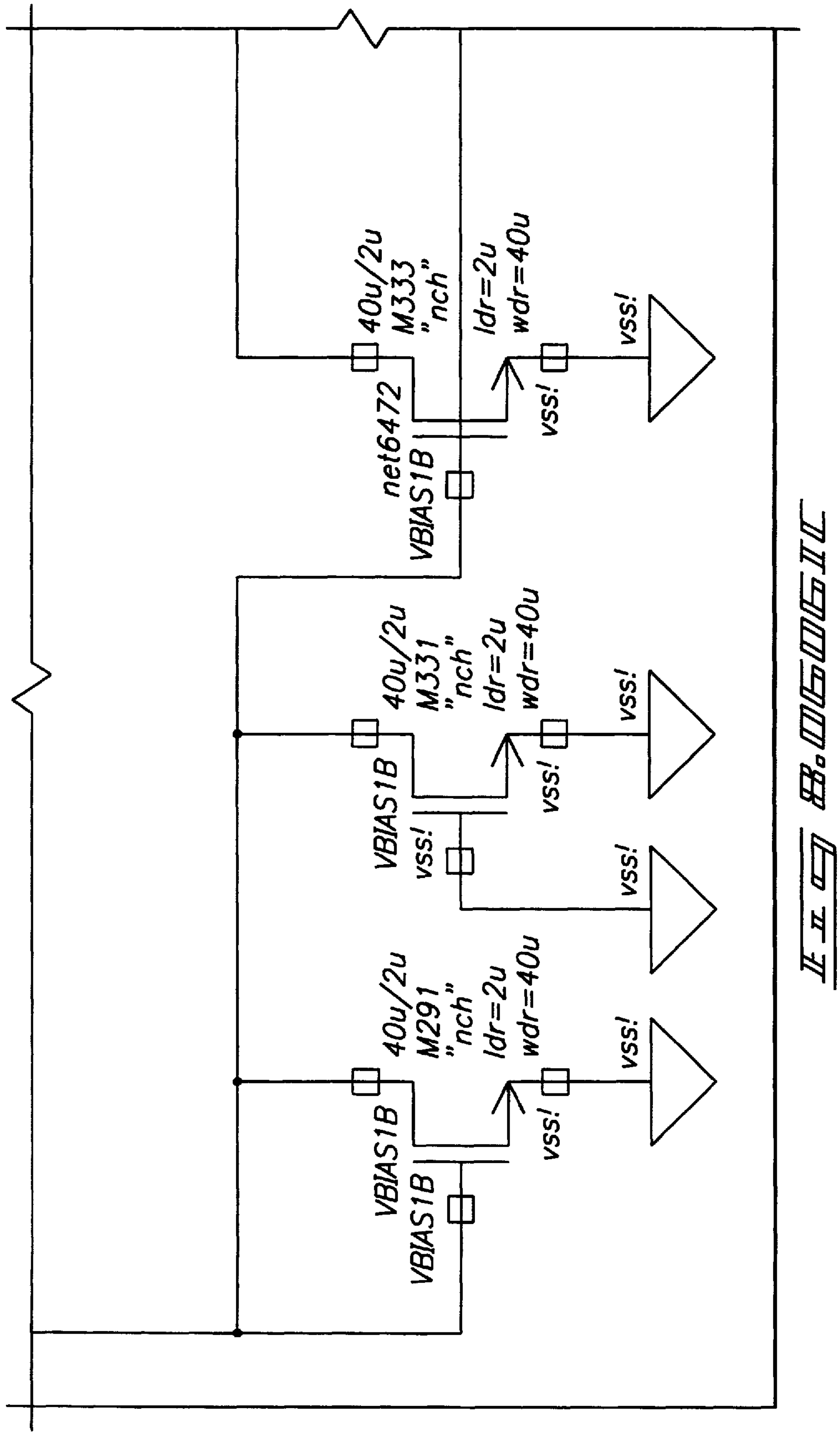
FIG. 8.06GIC

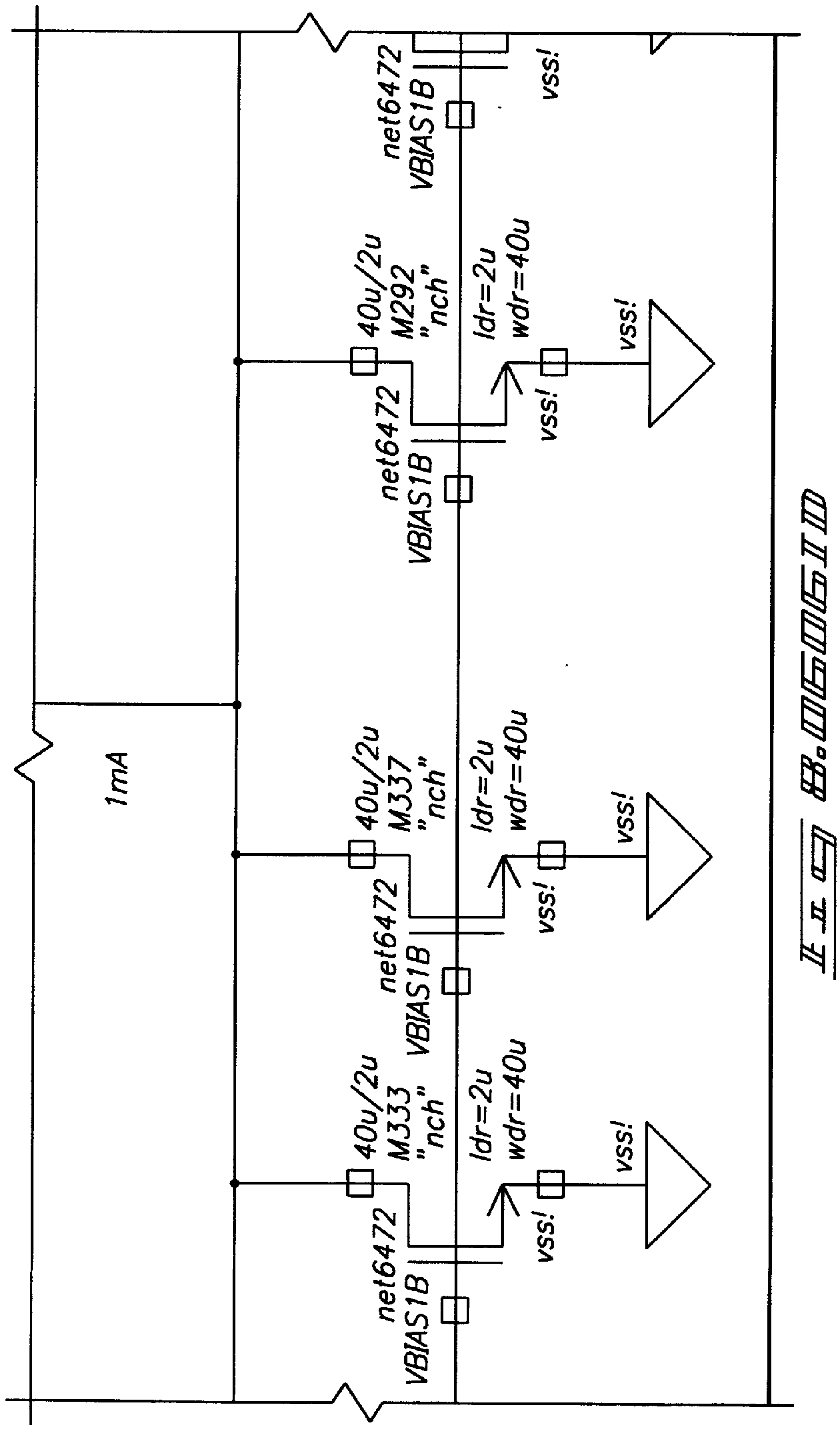
FIG. 8.06G6IID

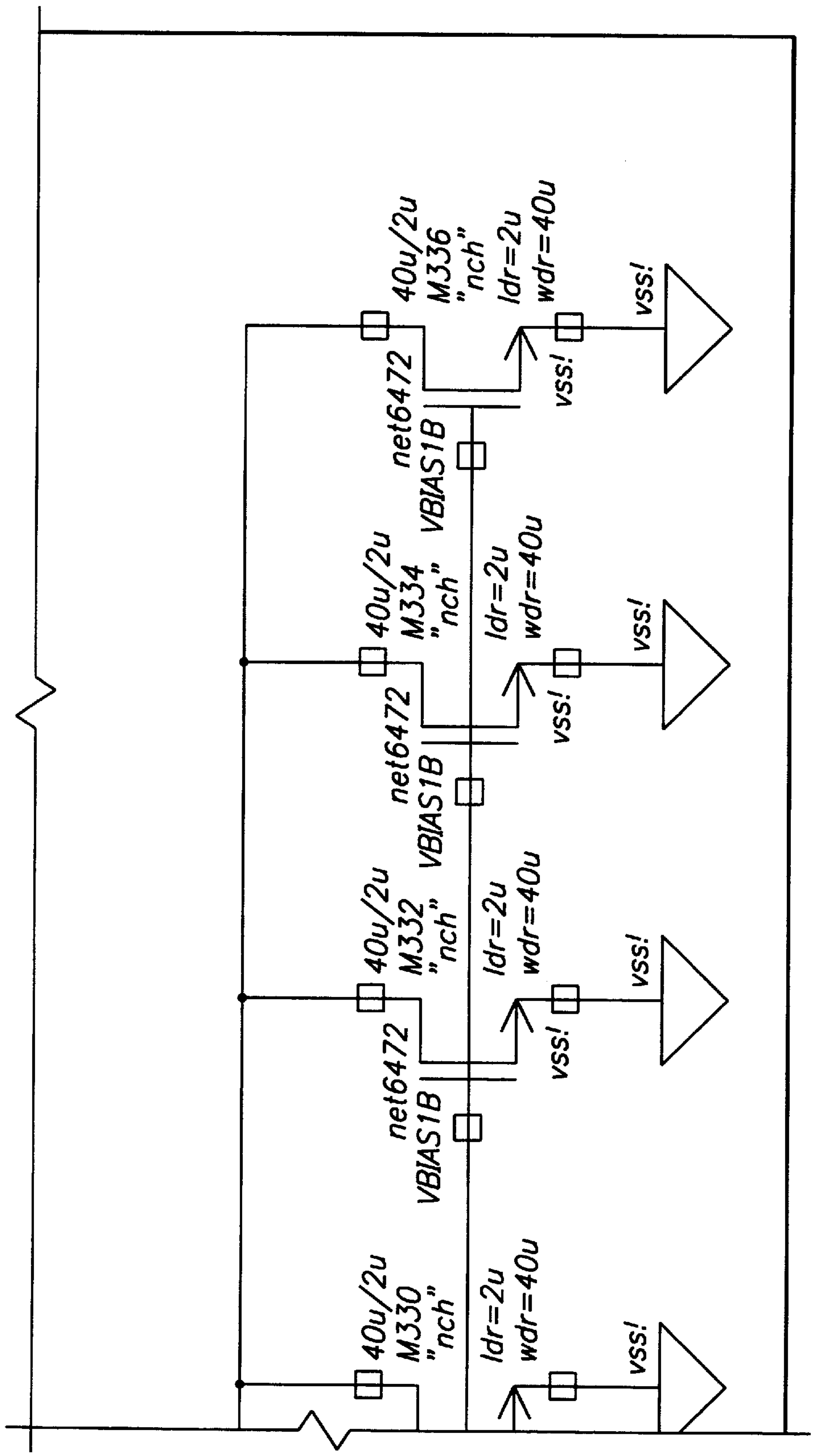
FIG. 8.0606E

| | | | | | | | | | |
|---|---|---|---|---|---|---|---|---|---|
| 8.0607AA | 8.0607AB | 8.0607AC | 8.0607AD | 8.0607AE | 8.0607AF | 8.0607AG | 8.0607AH | 8.0607AI | 8.0607AJ |
| 8.0607BA | 8.0607BB | 8.0607BC | 8.0607BD | 8.0607BE | 8.0607BF | 8.0607BG | 8.0607BH | 8.0607BI | 8.0607BJ |
| 8.0607CA | 8.0607CB | 8.0607CC | 8.0607CD | 8.0607CE | 8.0607CF | 8.0607CG | 8.0607CH | 8.0607CI | 8.0607CJ |
| 8.0607DA | 8.0607DB | 8.0607DC | 8.0607DD | 8.0607DE | 8.0607DF | 8.0607DG | 8.0607DH | 8.0607DI | 8.0607DJ |
| 8.0607EA | 8.0607EB | 8.0607EC | 8.0607ED | 8.0607EE | 8.0607EF | 8.0607EG | 8.0607EH | 8.0607EI | 8.0607EJ |
| 8.0607FA | 8.0607FB | 8.0607FC | 8.0607FD | 8.0607FE | 8.0607FF | 8.0607FG | 8.0607FH | 8.0607FI | 8.0607FJ |
| 8.0607GA | 8.0607GB | 8.0607GC | 8.0607GD | 8.0607GE | 8.0607GF | 8.0607GG | 8.0607GH | 8.0607GI | 8.0607GJ |
| 8.0607HA | 8.0607HB | 8.0607HC | 8.0607HD | 8.0607HE | 8.0607HF | 8.0607HG | 8.0607HH | 8.0607HI | 8.0607HJ |
| 8.0607IA | 8.0607IB | 8.0607IC | 8.0607ID | 8.0607IE | 8.0607IF | 8.0607IG | 8.0607IH | 8.0607II | 8.0607IJ |
| 8.0607JA | 8.0607JB | 8.0607JC | 8.0607JD | 8.0607JE | 8.0607JF | 8.0607JG | 8.0607JH | 8.0607JI | 8.0607JJ |

Fig 8.0607

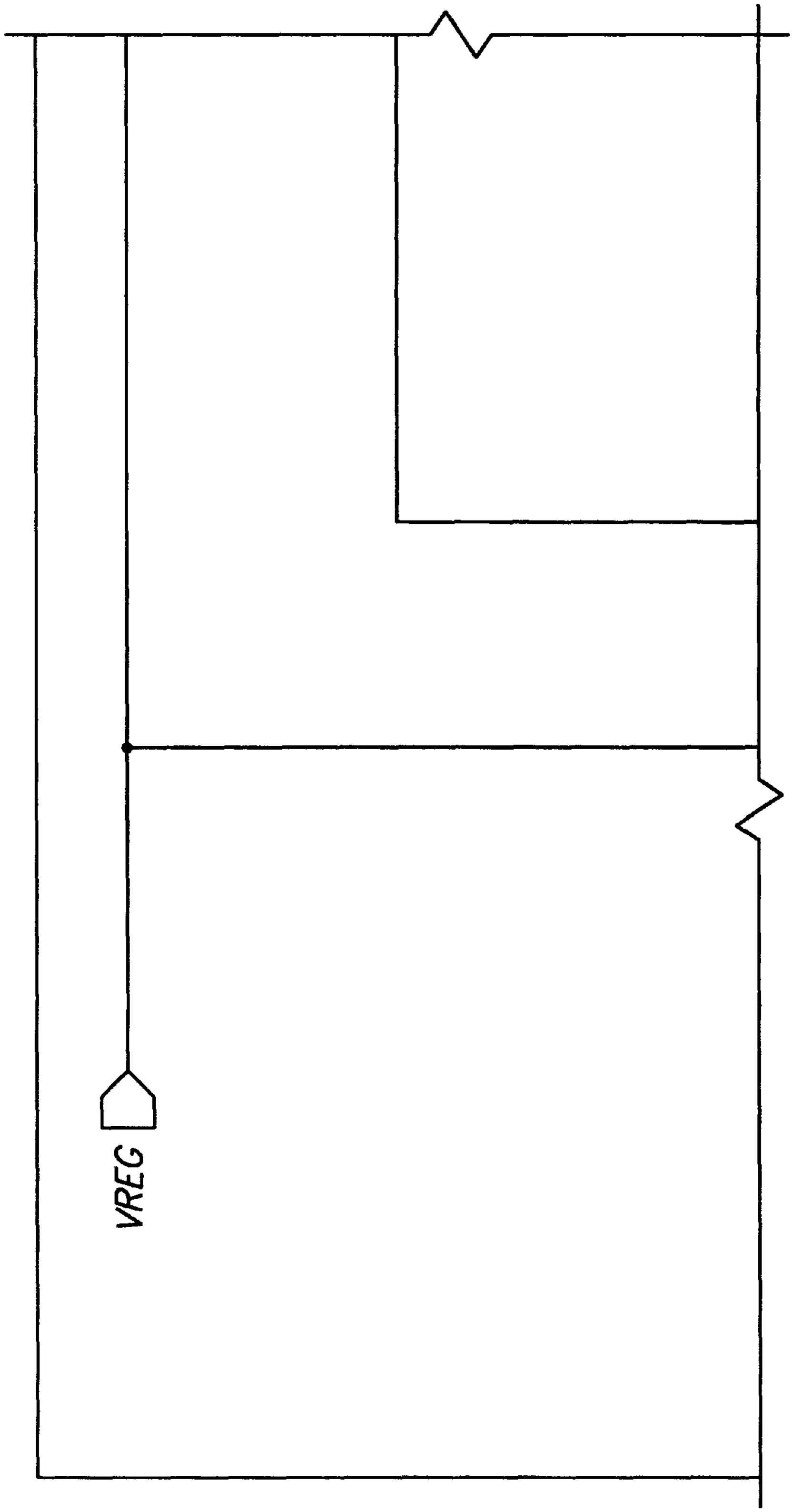
FIG. 8.0060.1AA

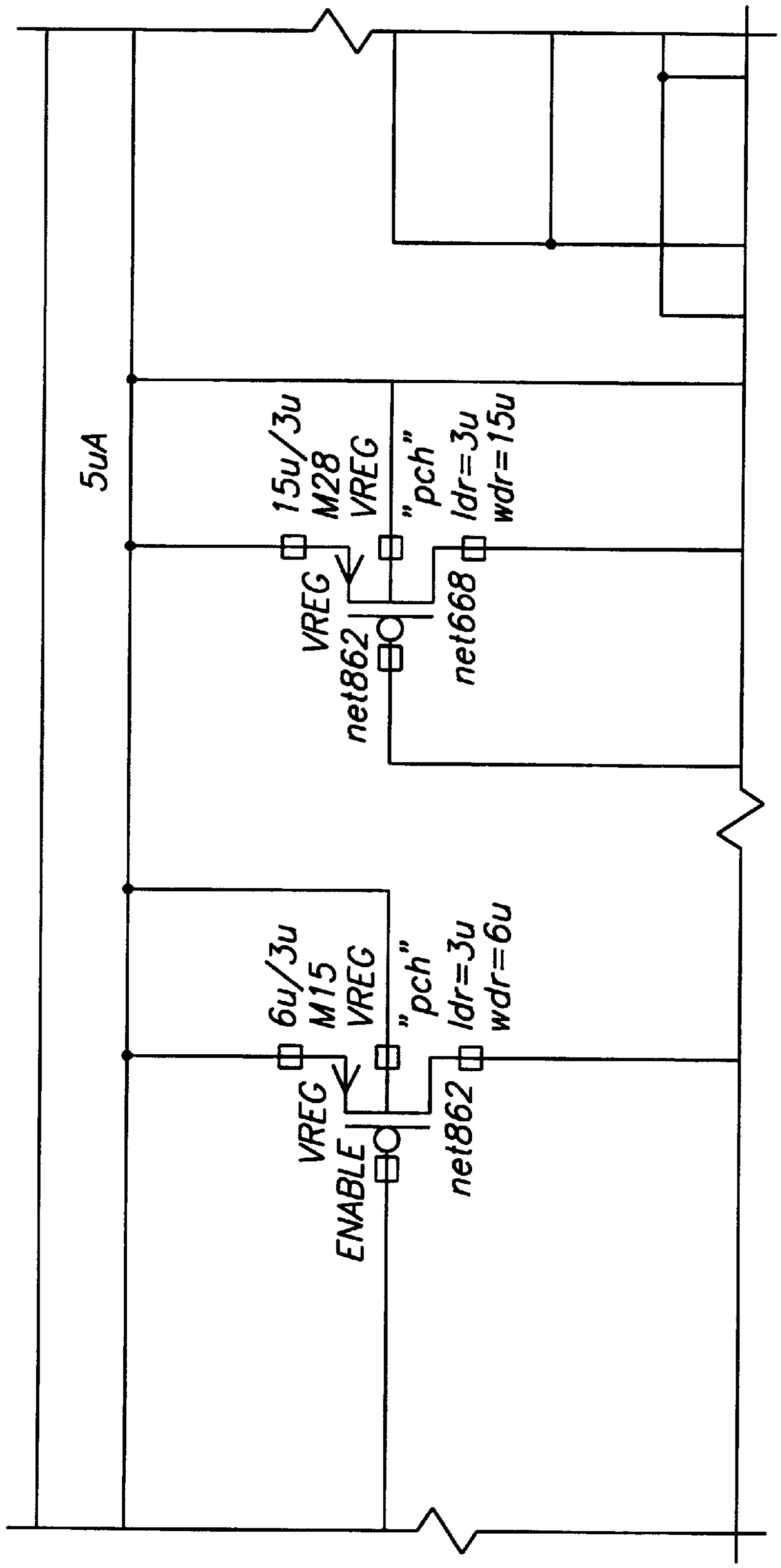
FIG. 8.0607AB

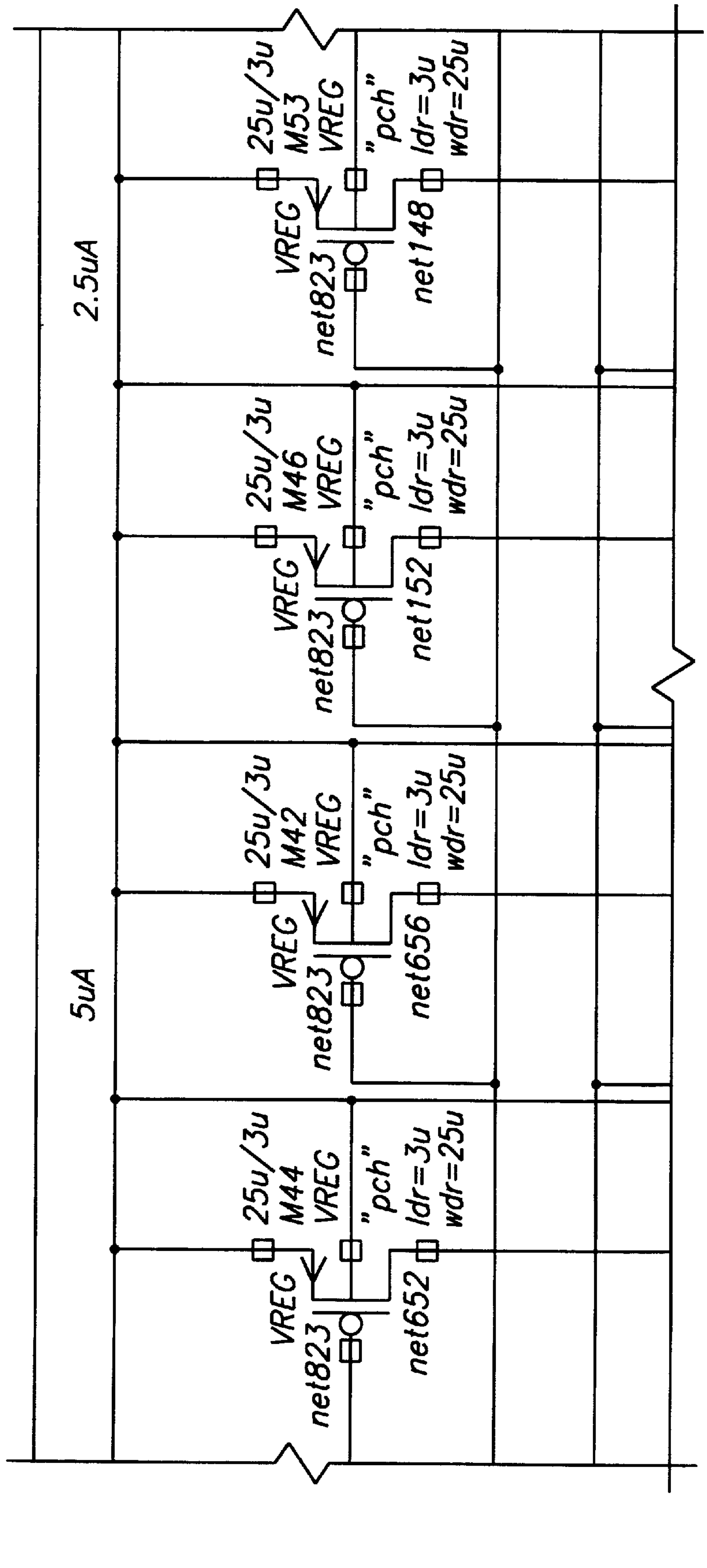
Fig. 8.060JAC

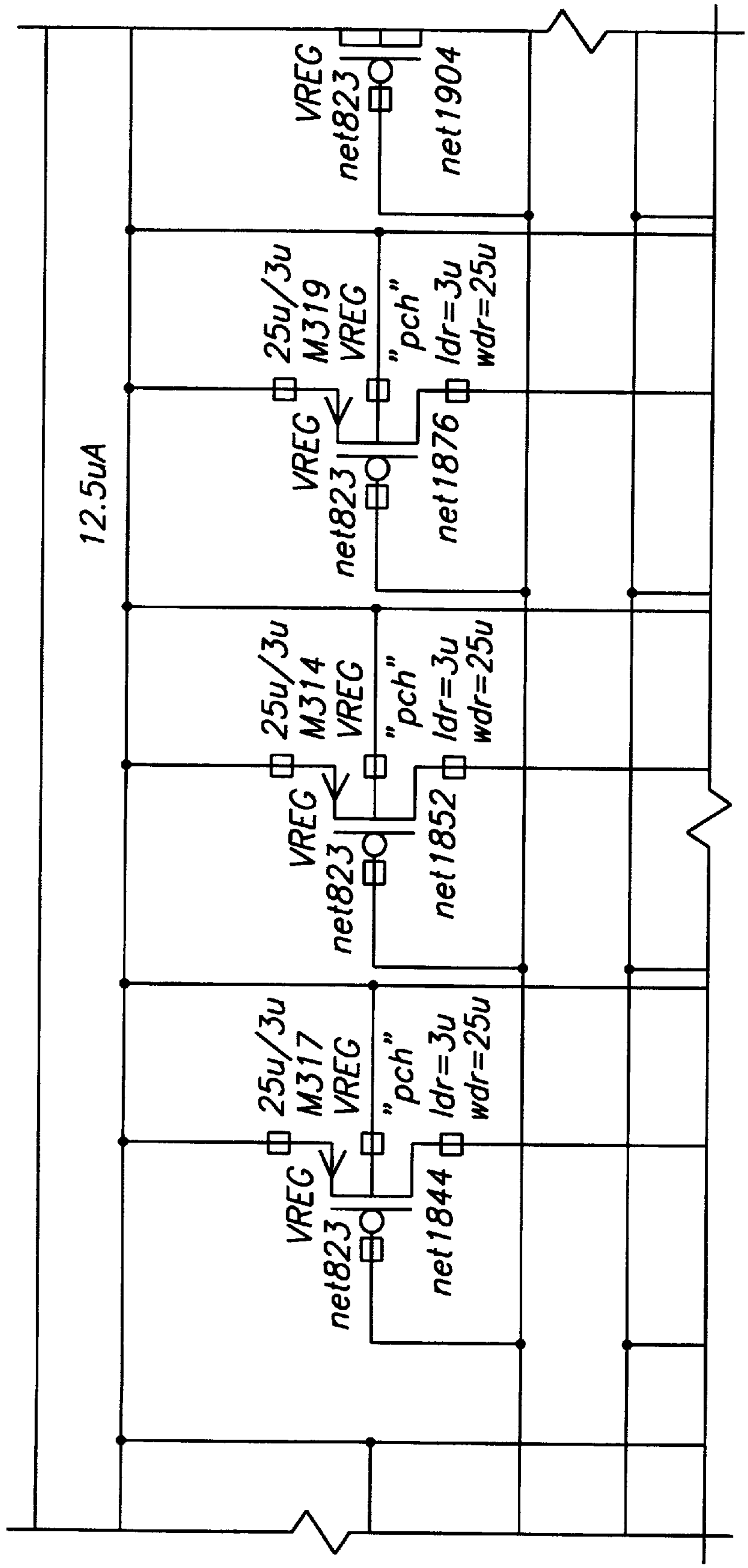
FIG. 8.0607AD

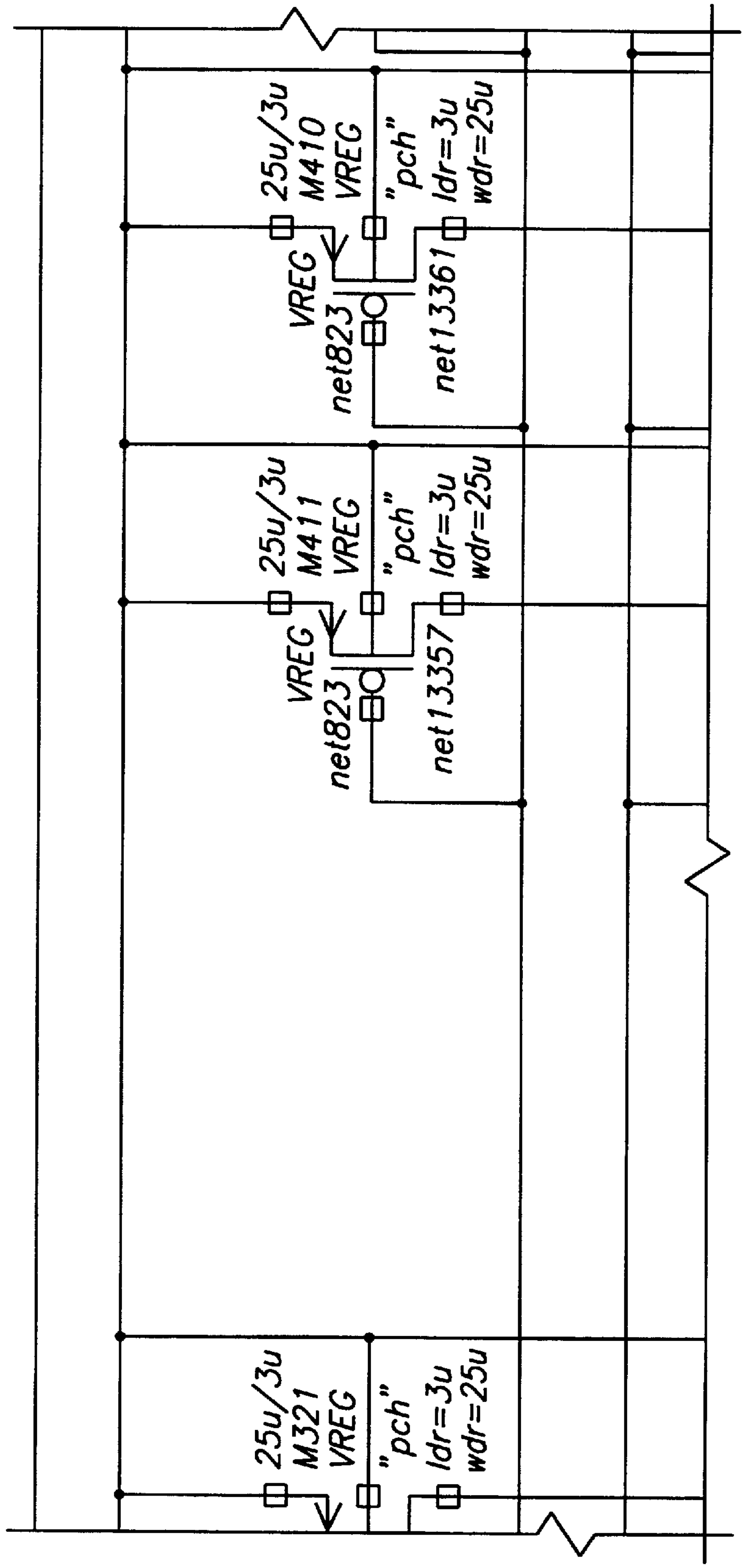
FIG 8.0607AE

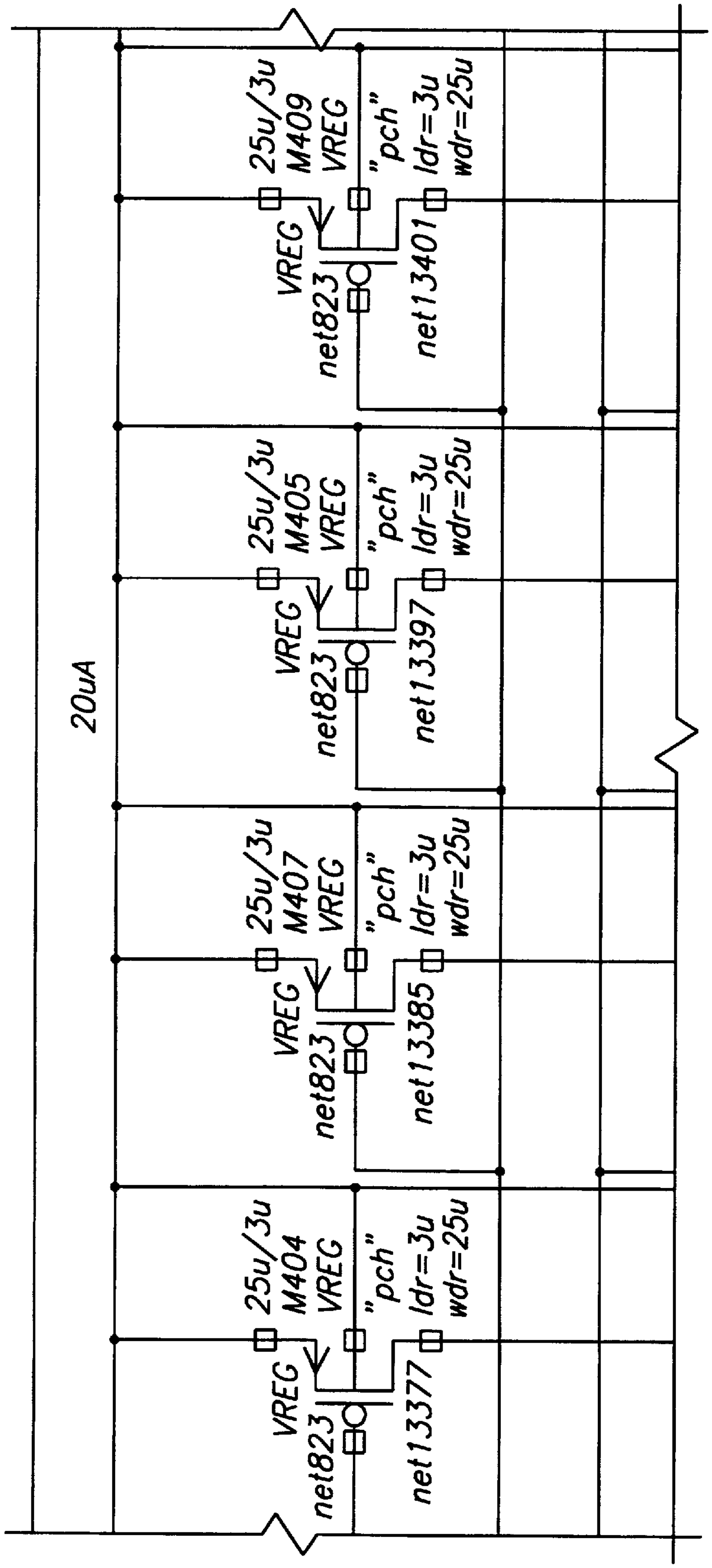
FIG. 8.060AF

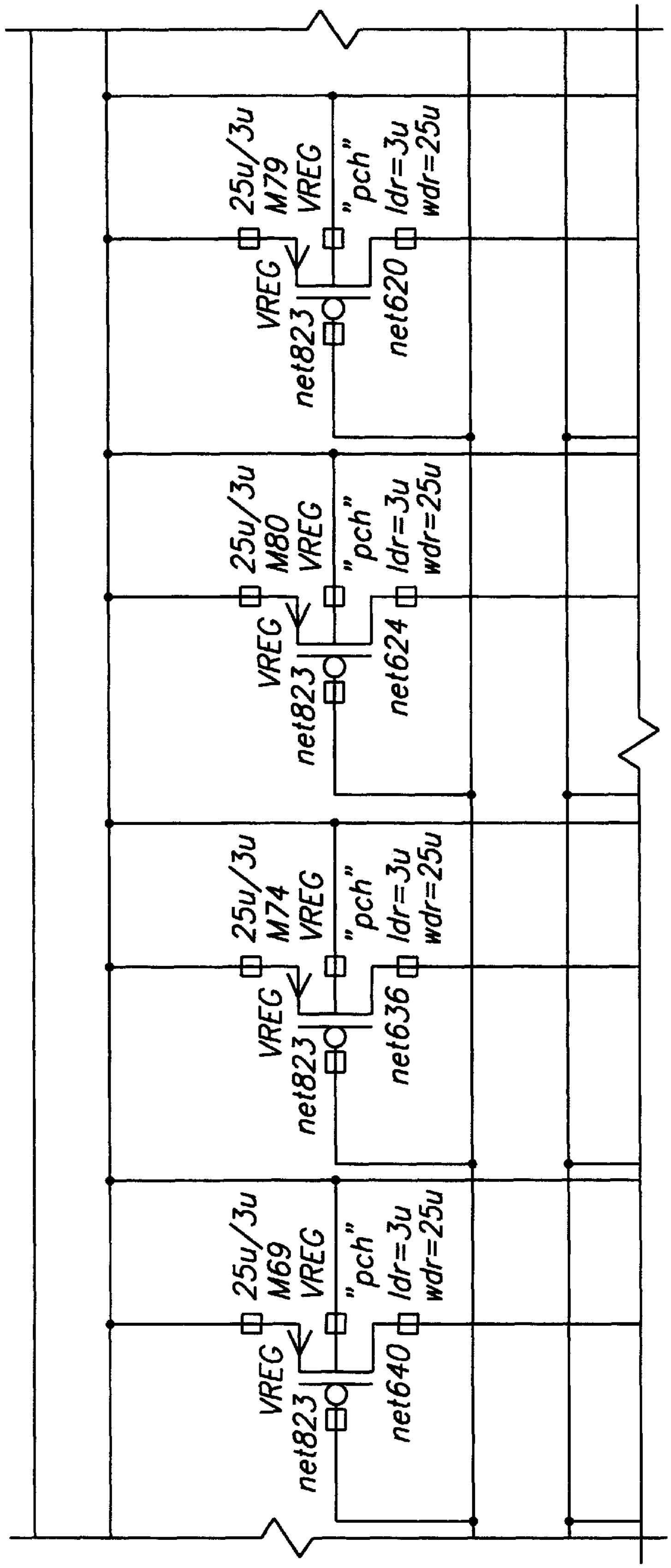
FIG. 8.060AG

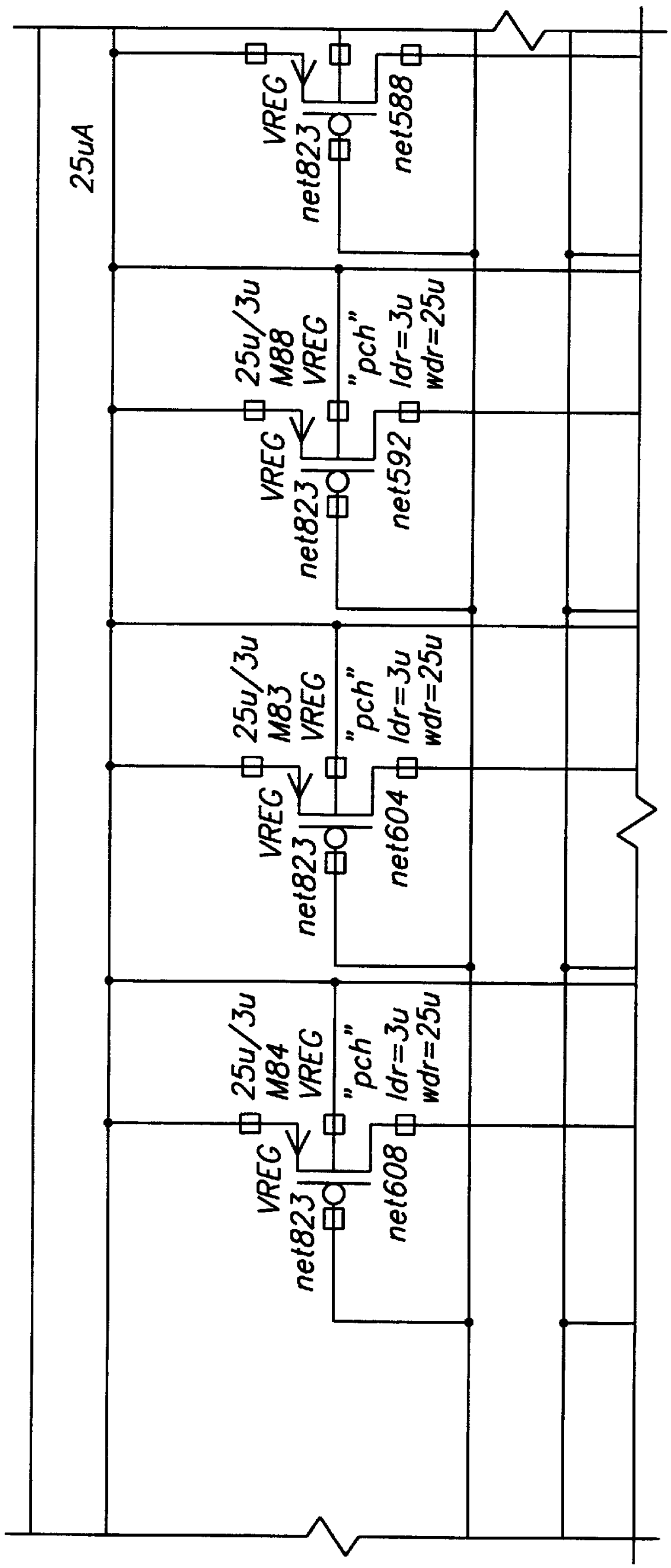
Fig. 8.0607AH

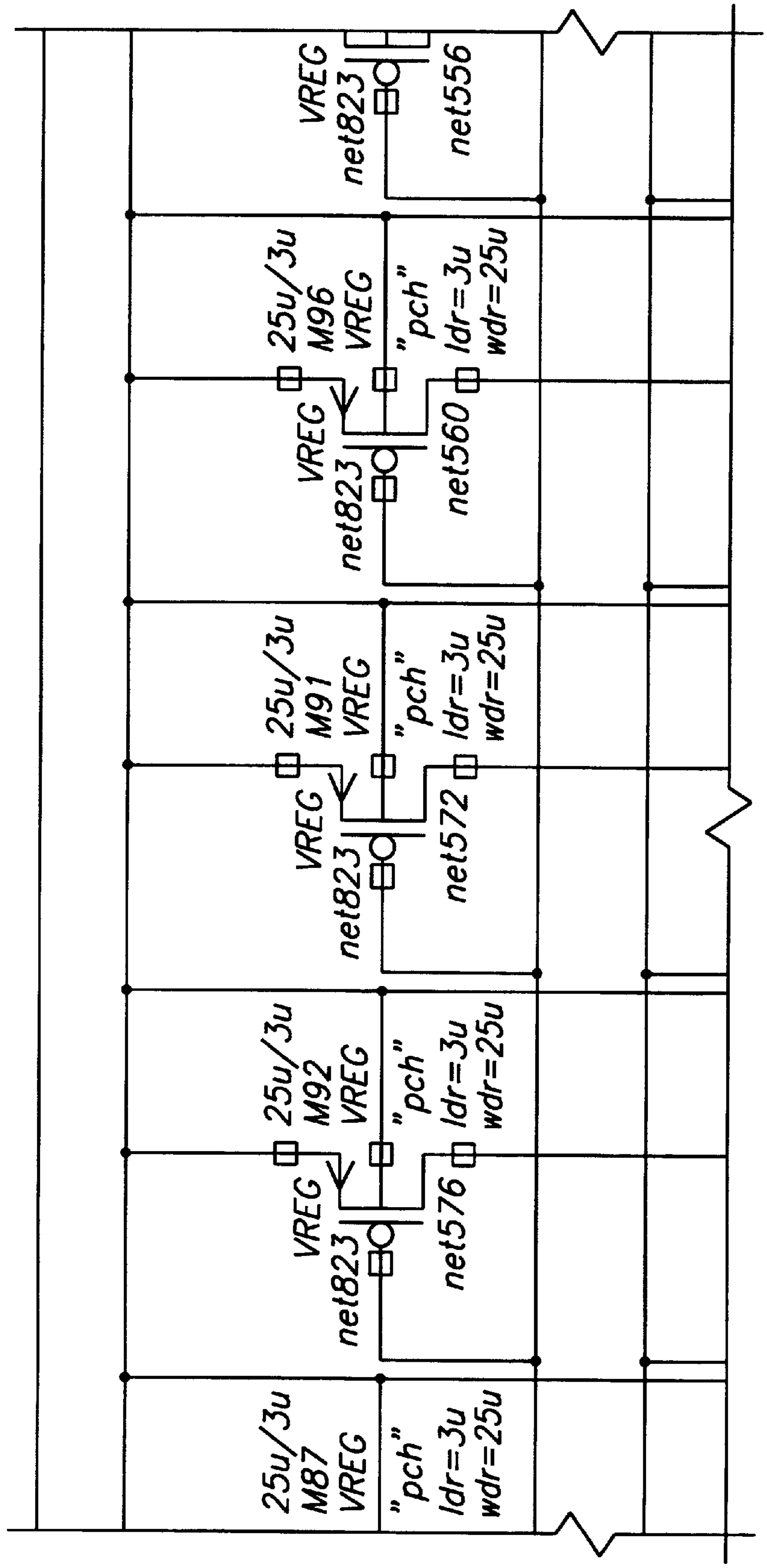
FIG. 8.060A1

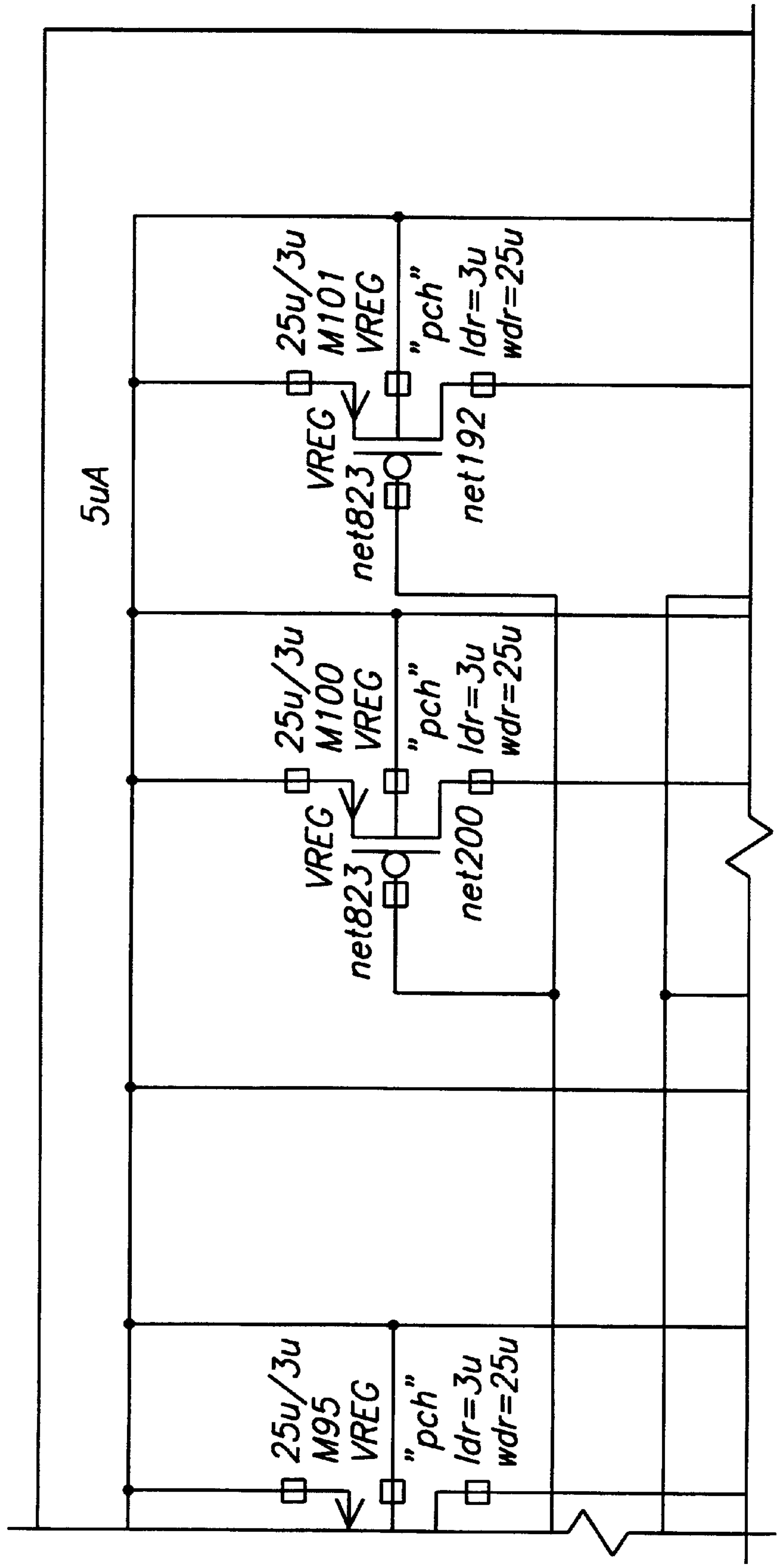
FIG. 8.0607AJ

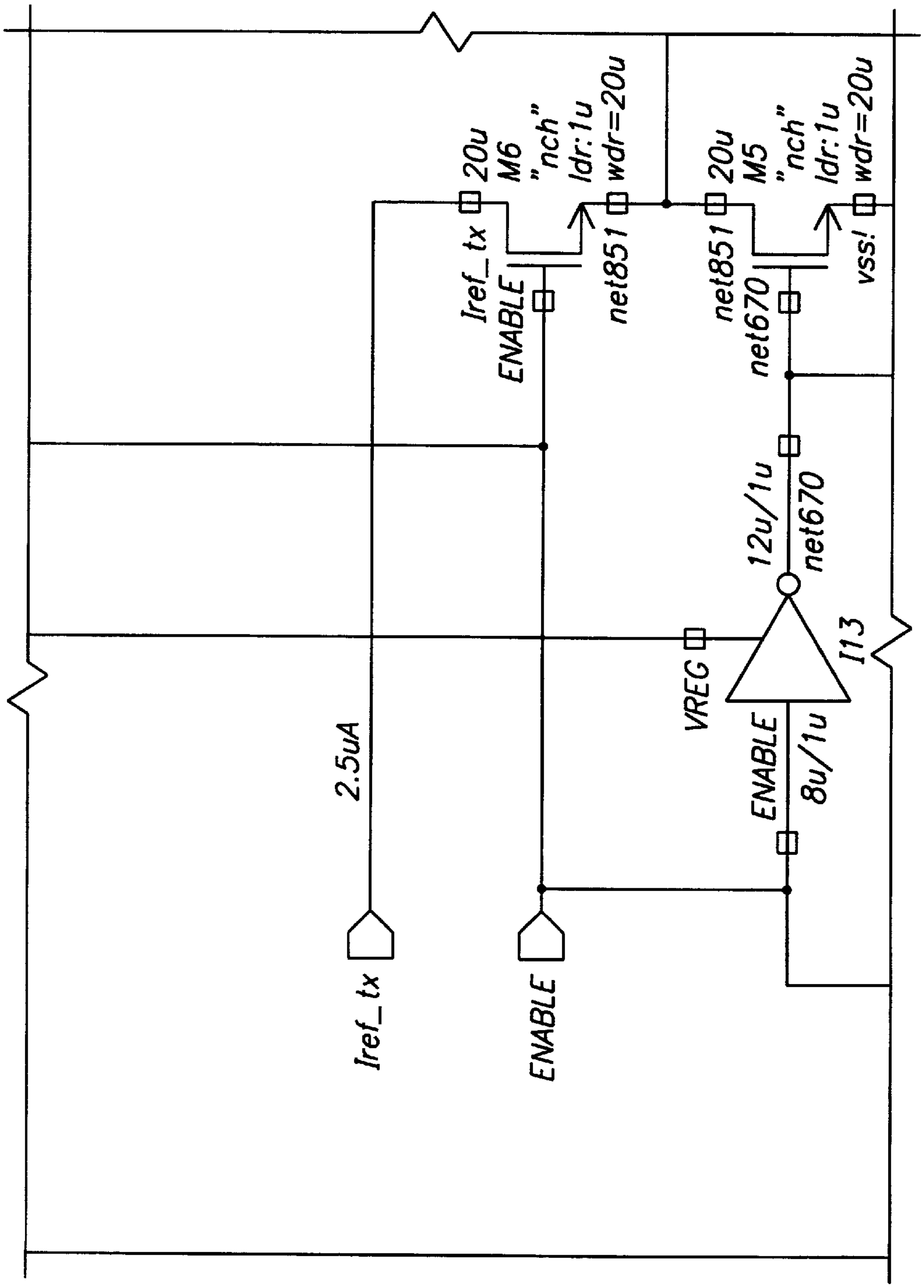
Fig. 8.0607BA

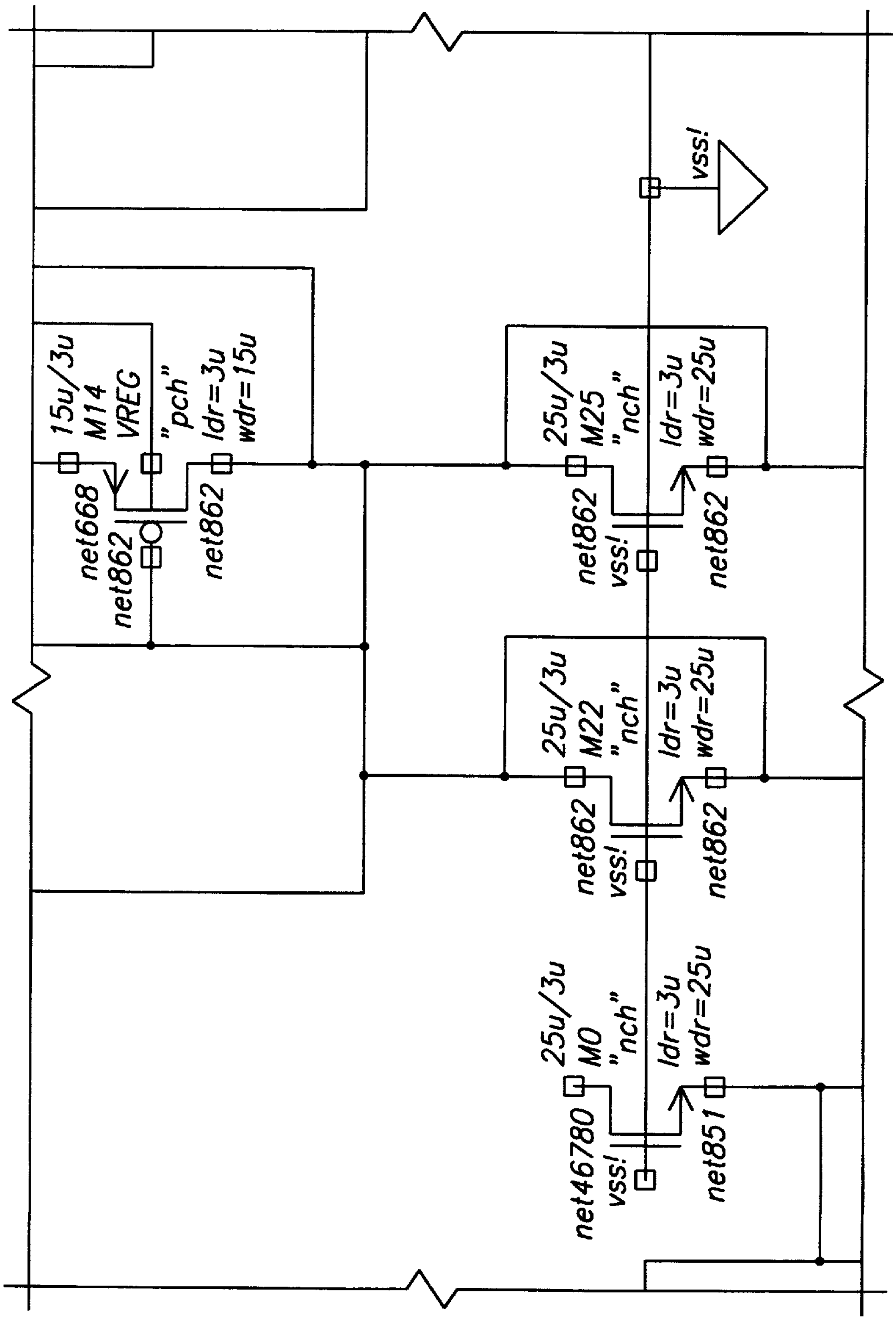
Fig. 8.0507BB

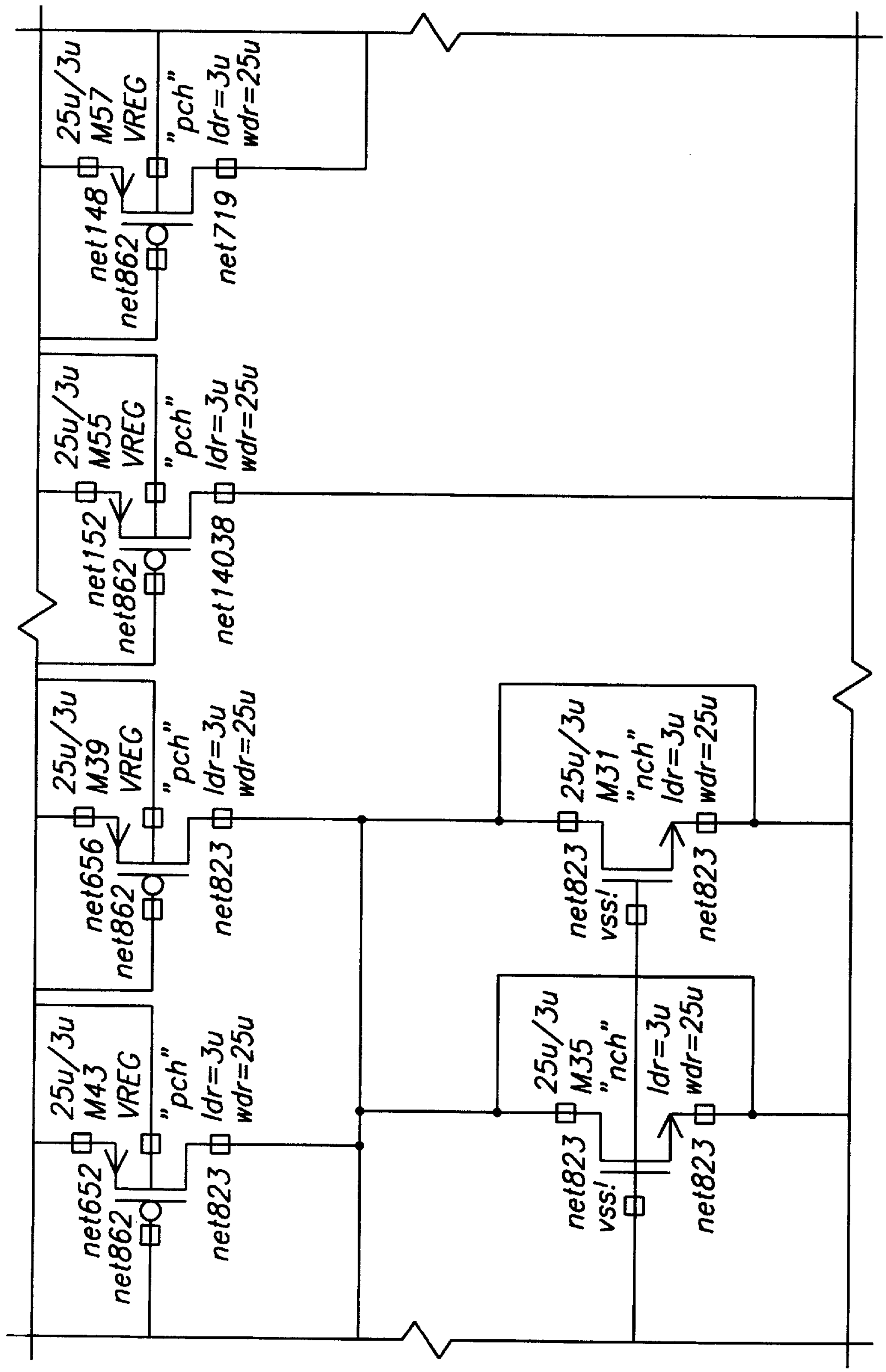
FIG. 8.0607BC

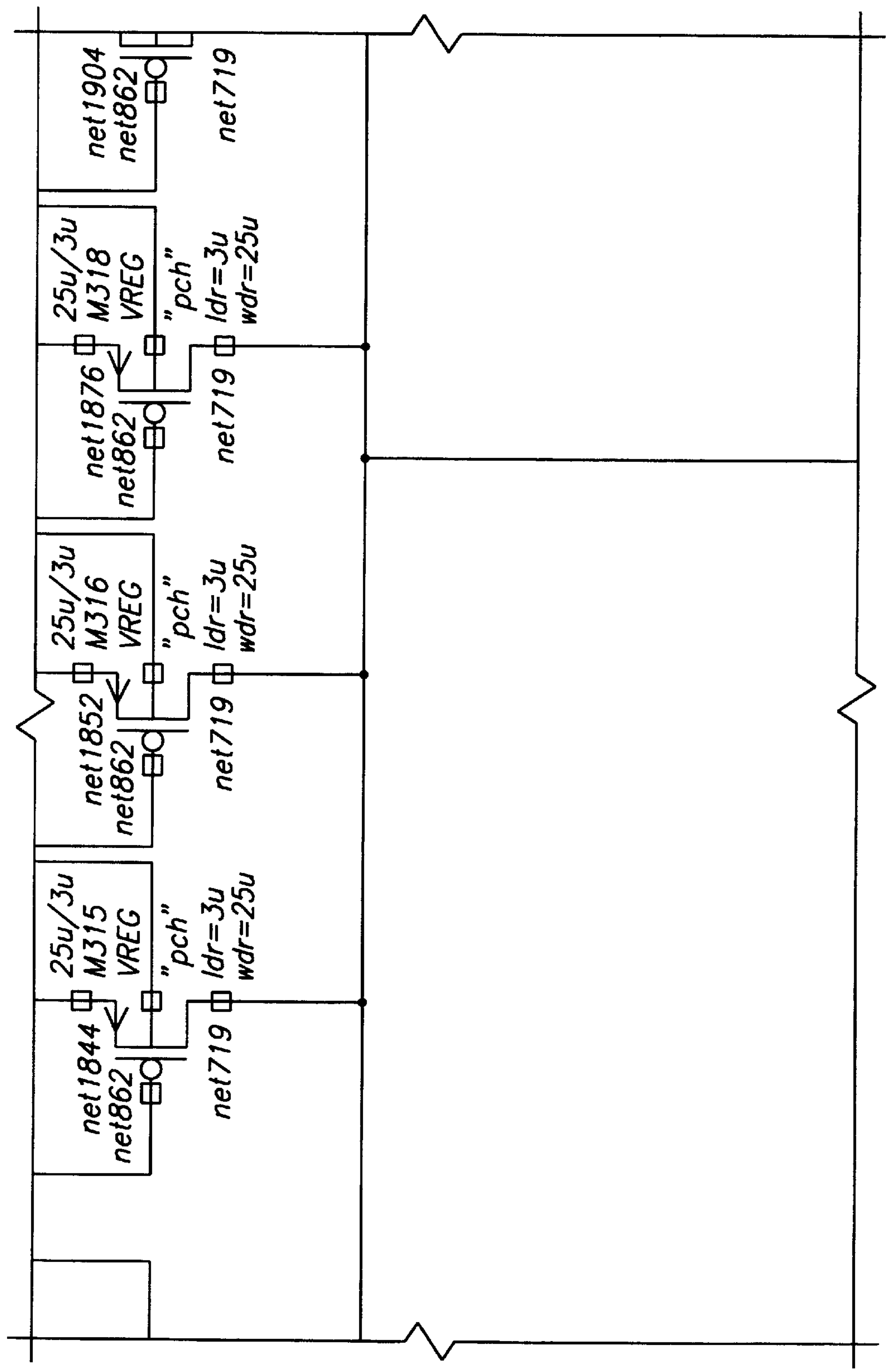
FIG. 8.0607BD

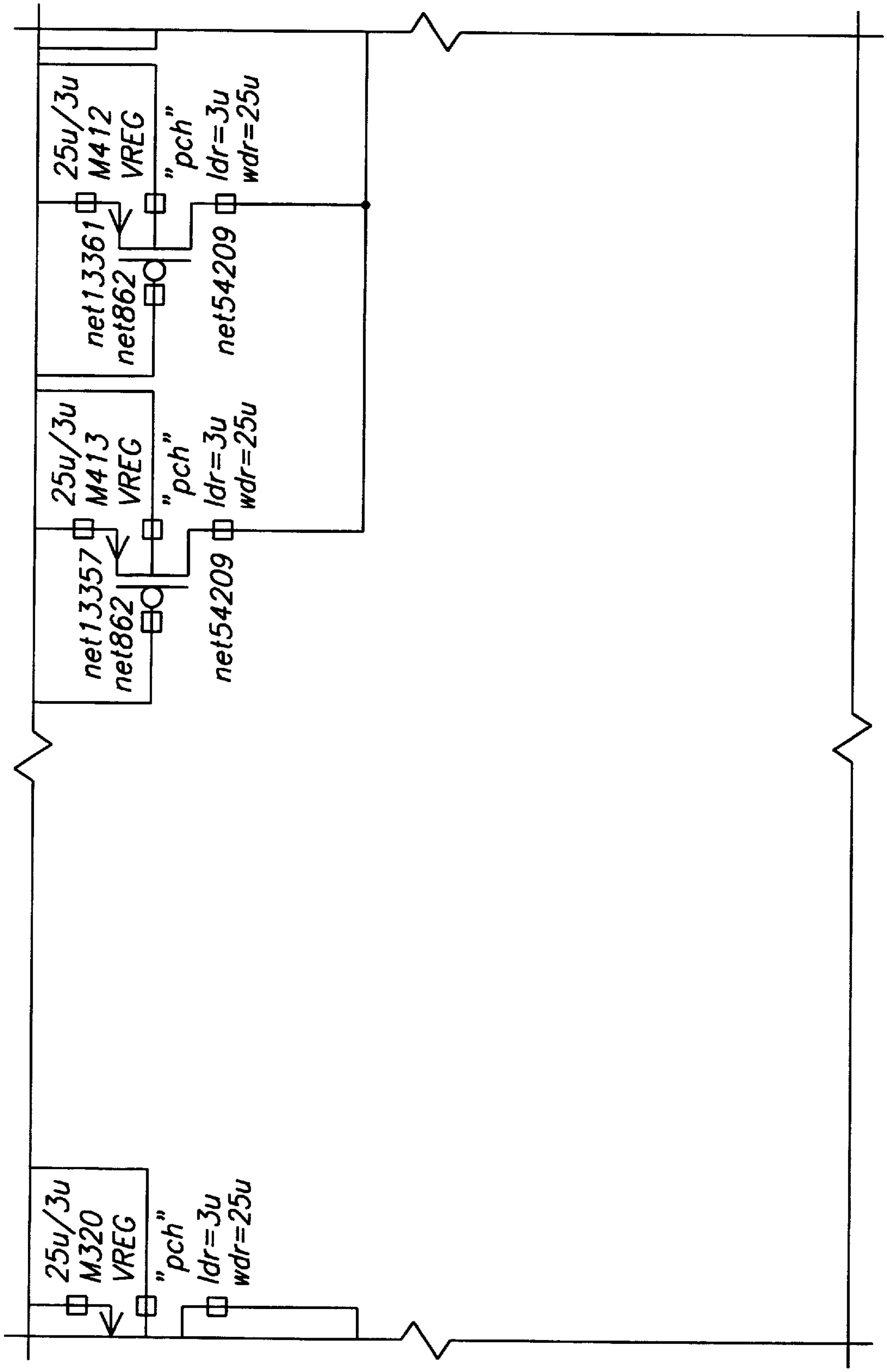
Fig 8.0607BE

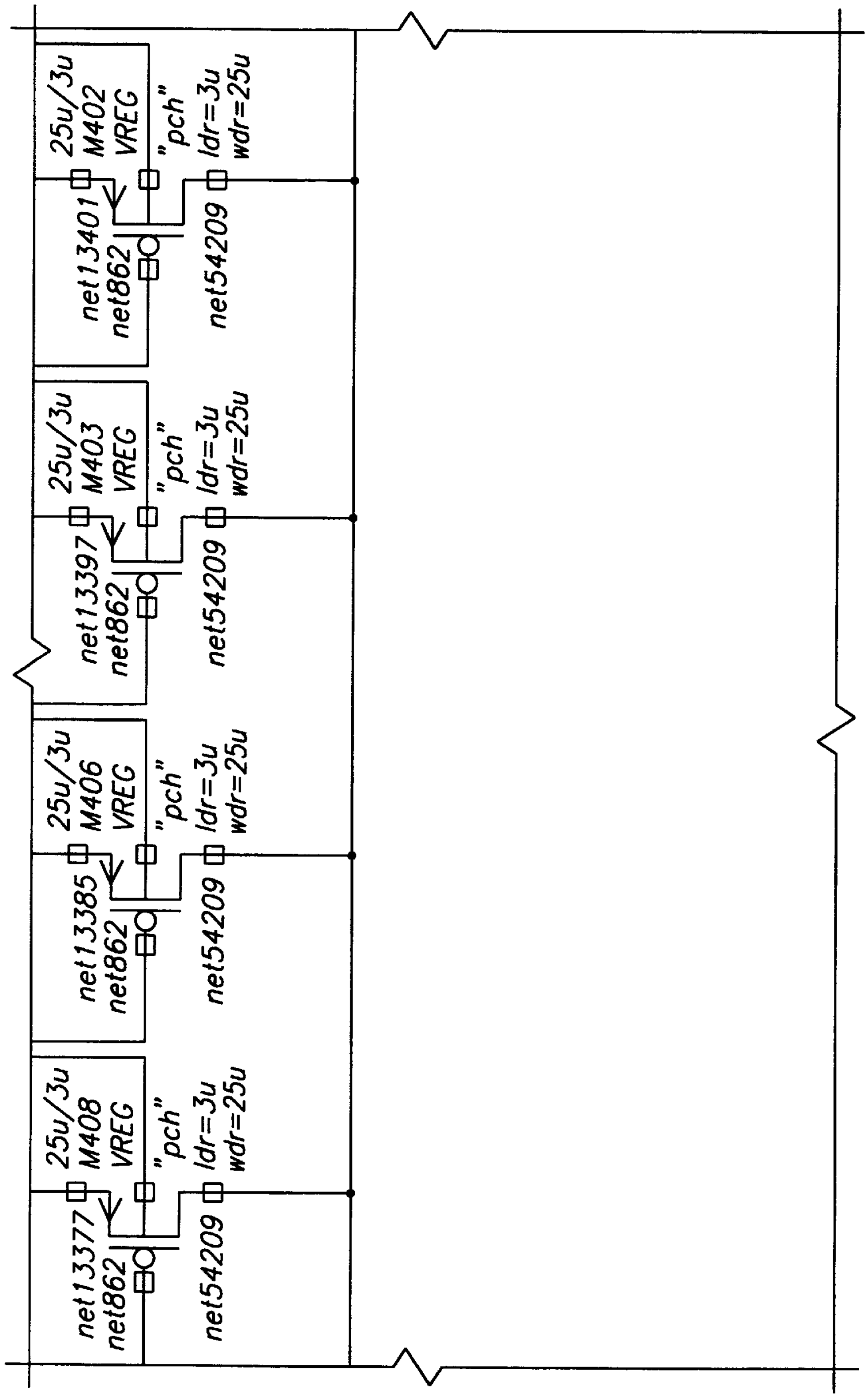
FIG. 8.0607BF

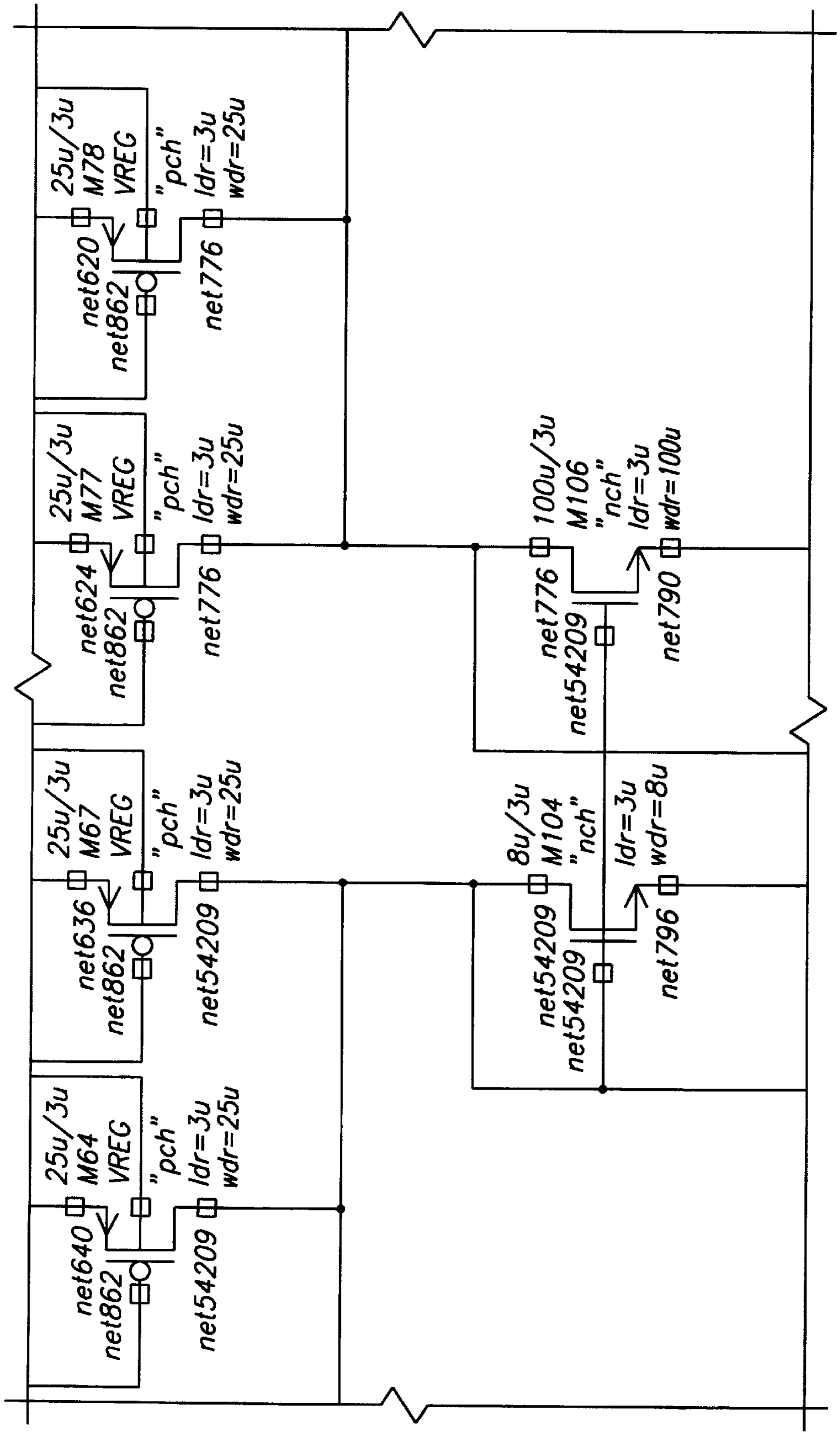
Fig. 8.0607.1BG

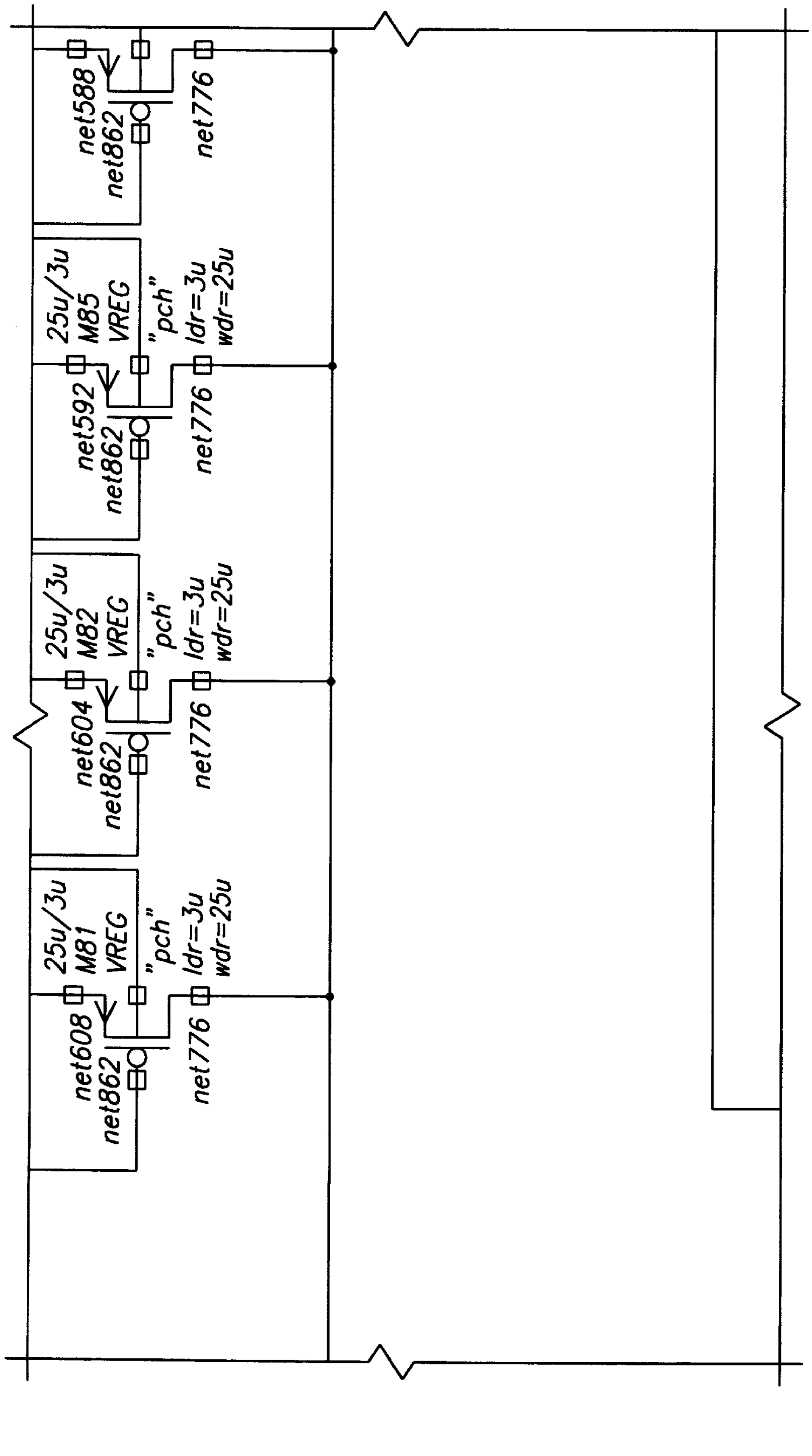
Fig. 8.060.7BH

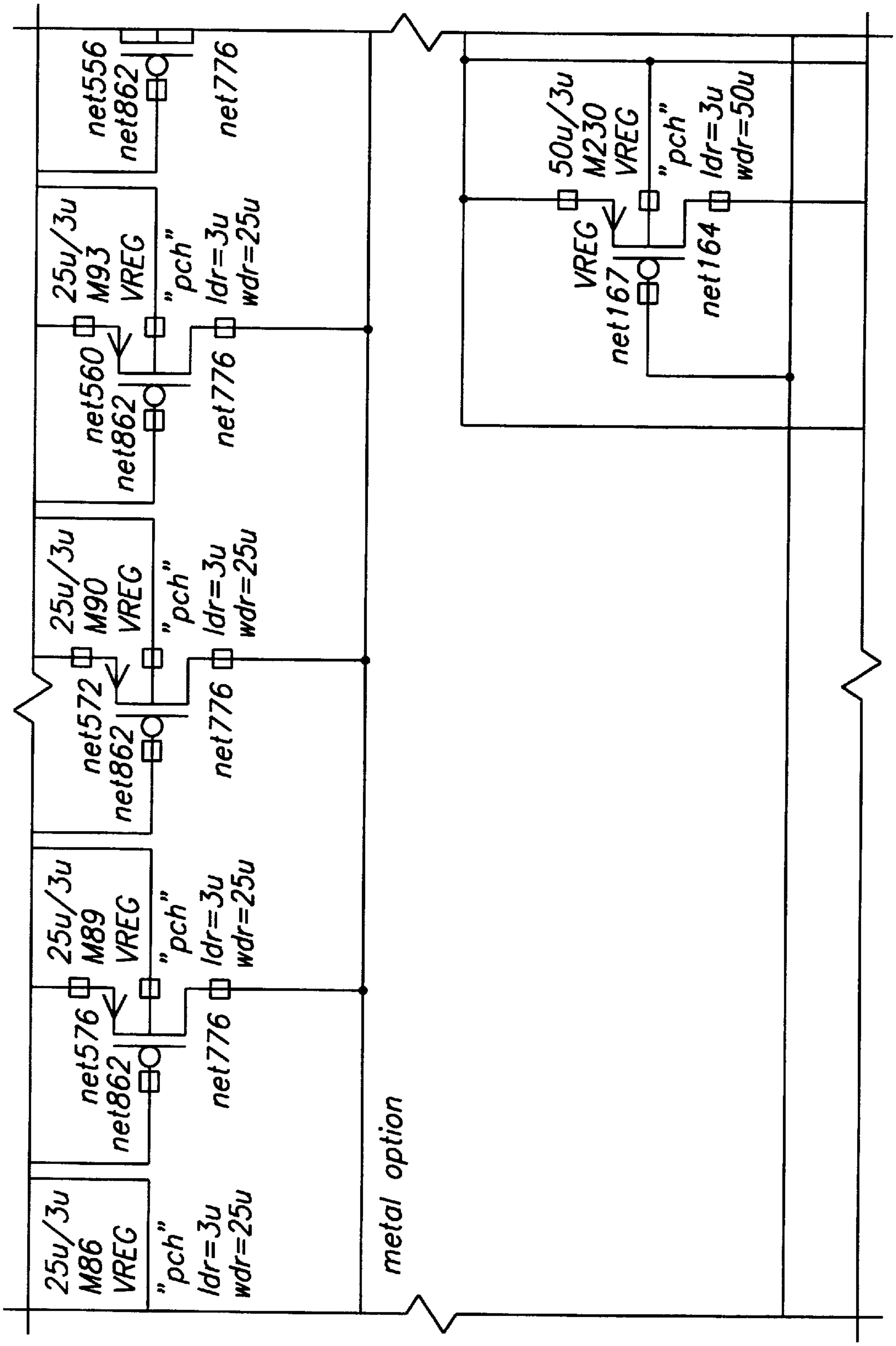
Fig. 8.06071BII

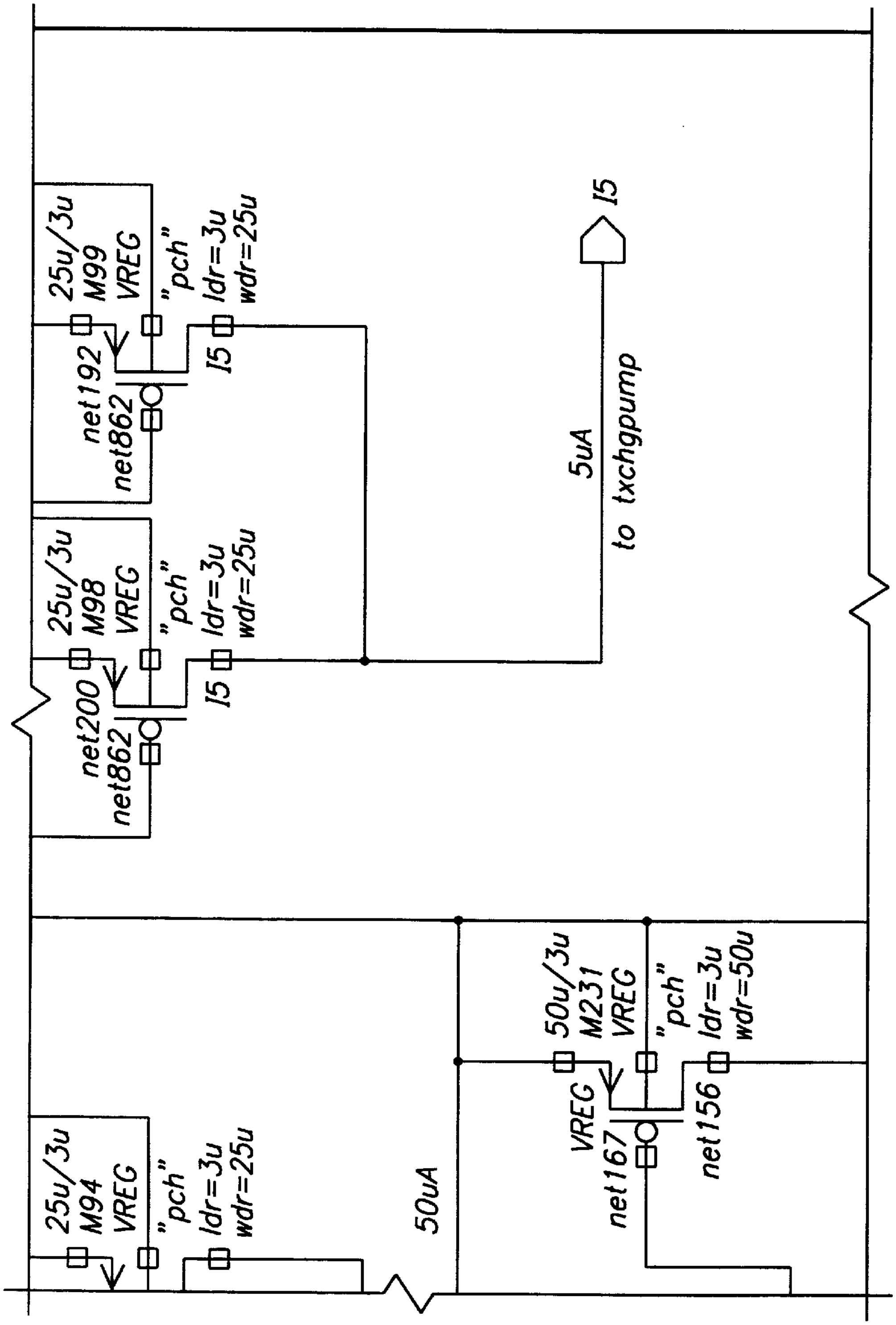
FIG. 8.0607B

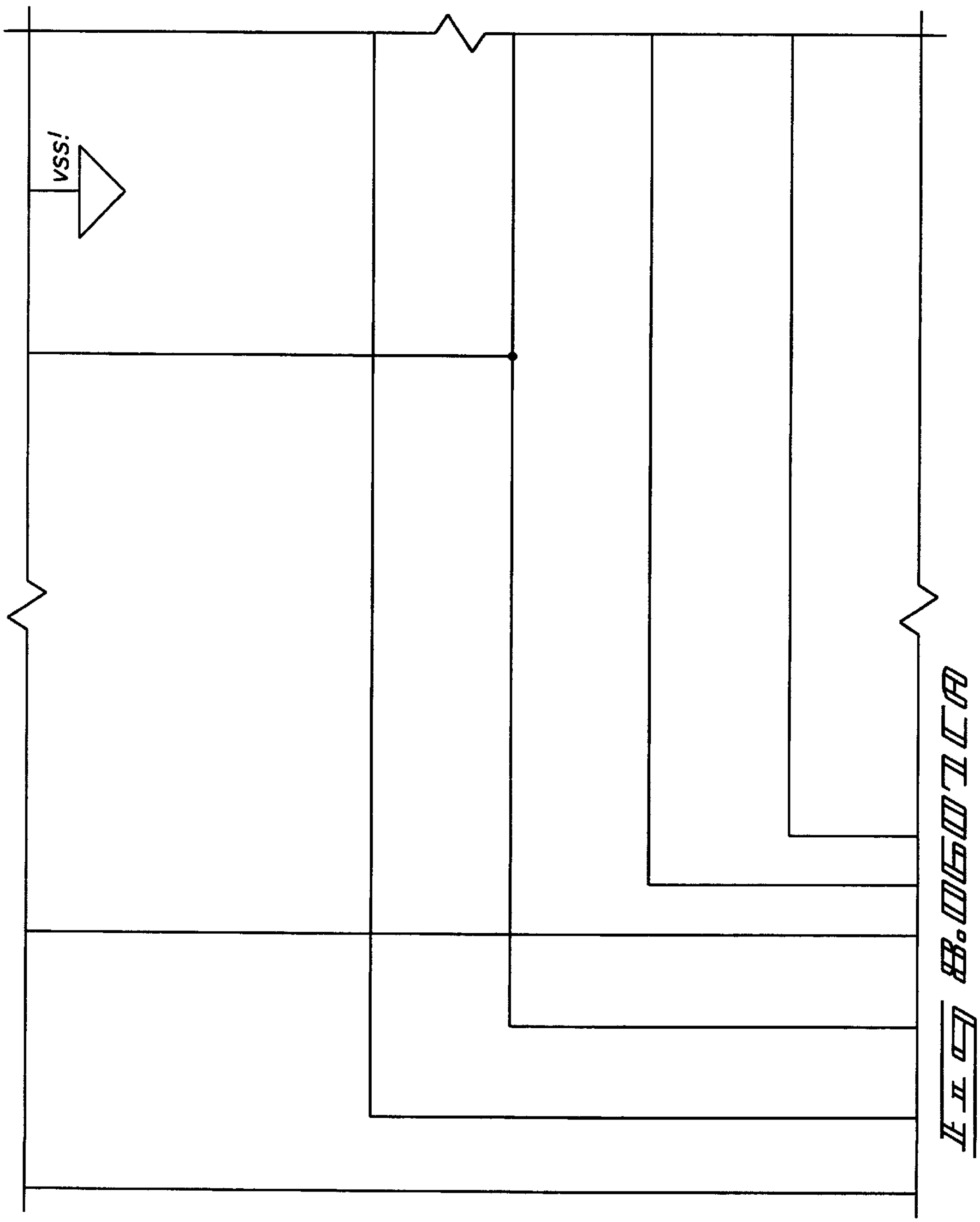
FIG. 8.0607LA

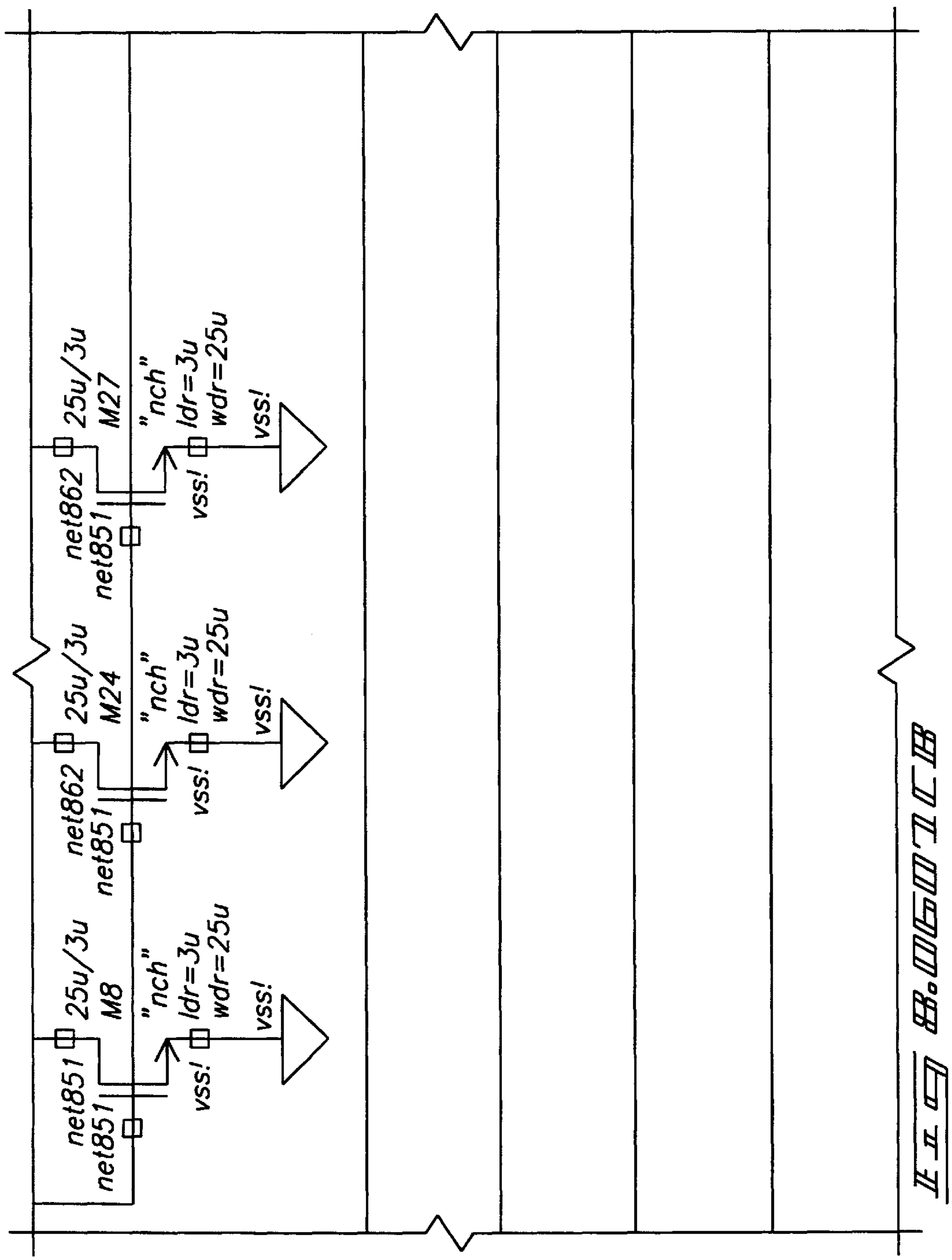
Fig. 8.0607CB

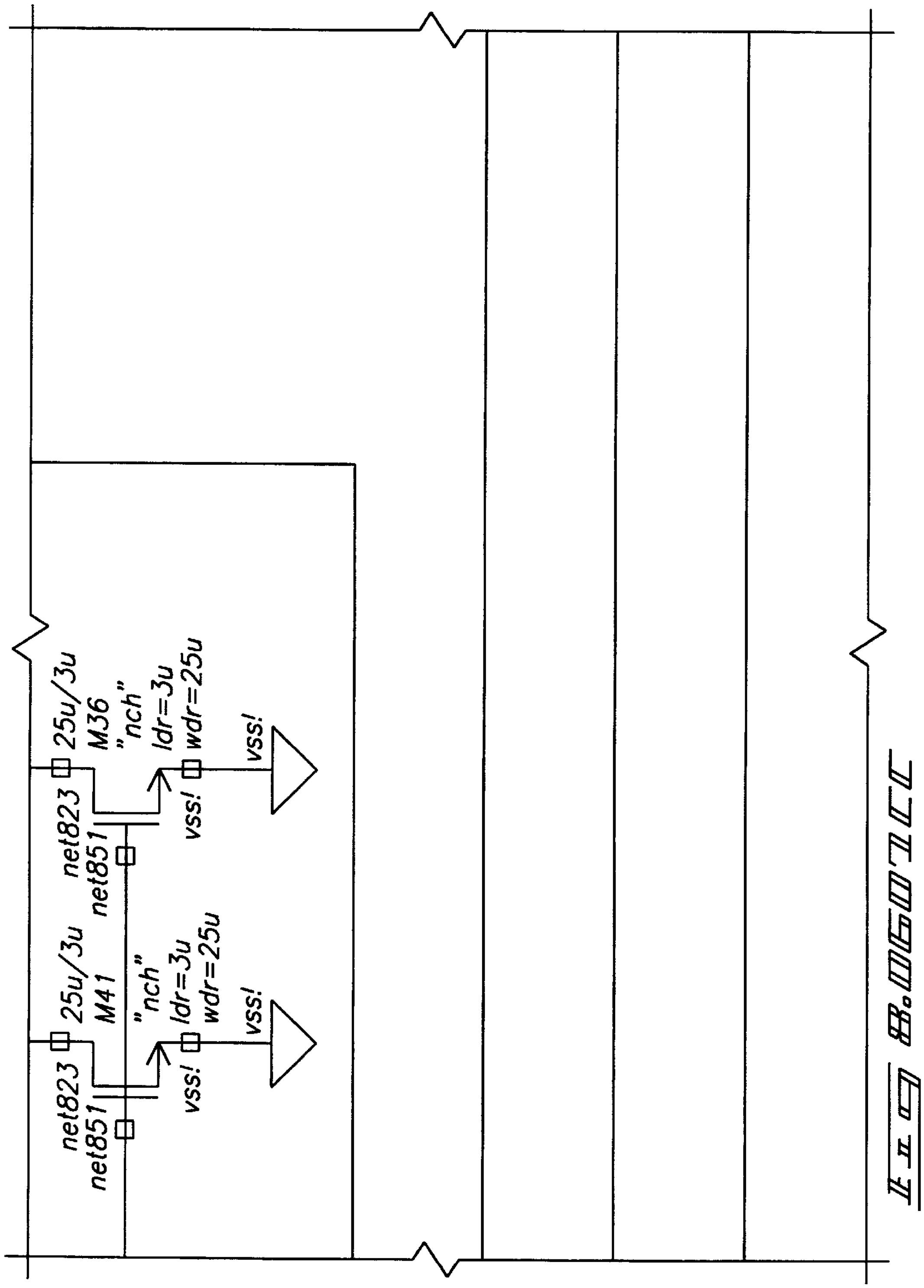
Fig. 8.060ICC

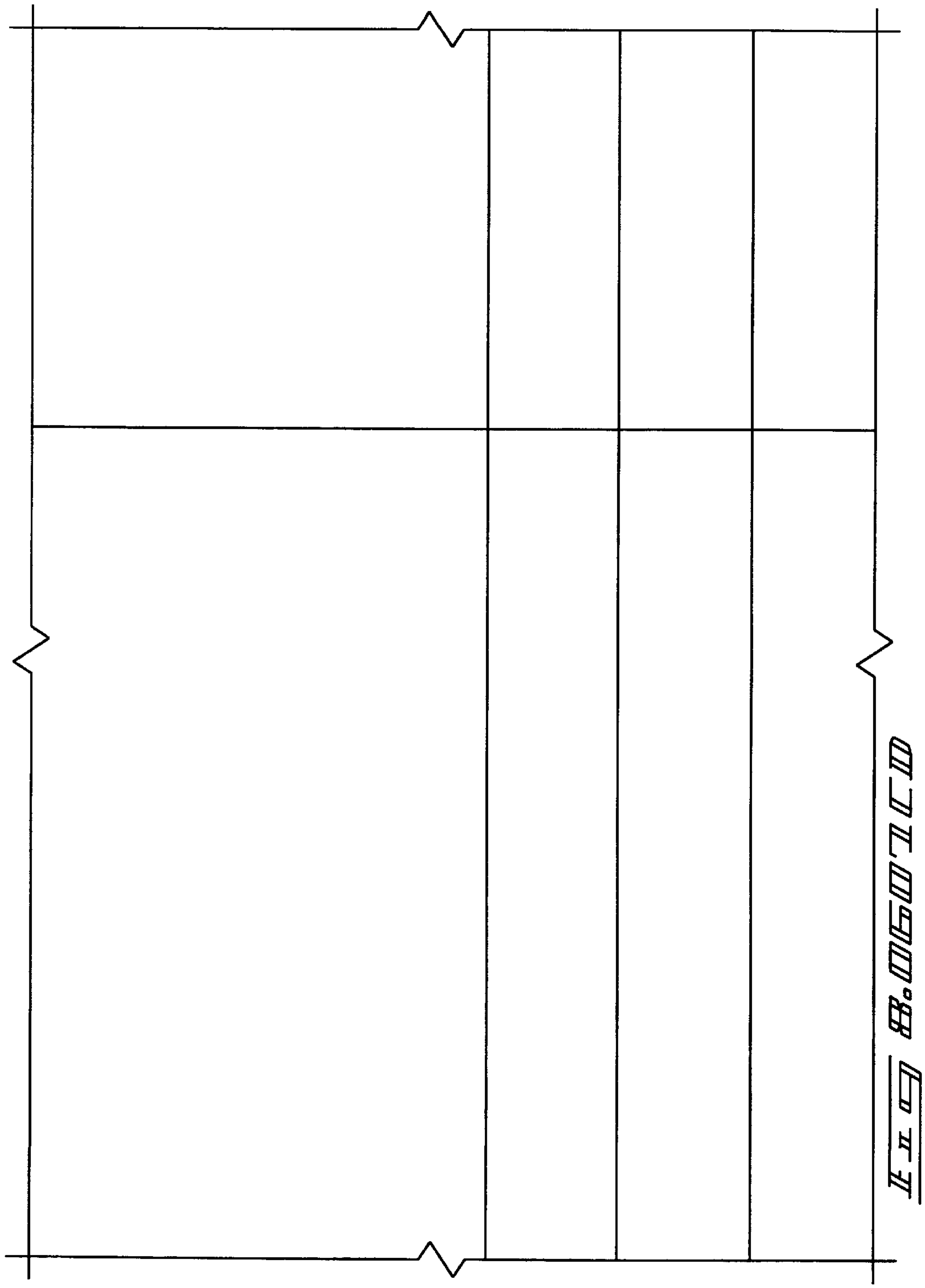
FIG. 8.0607CD

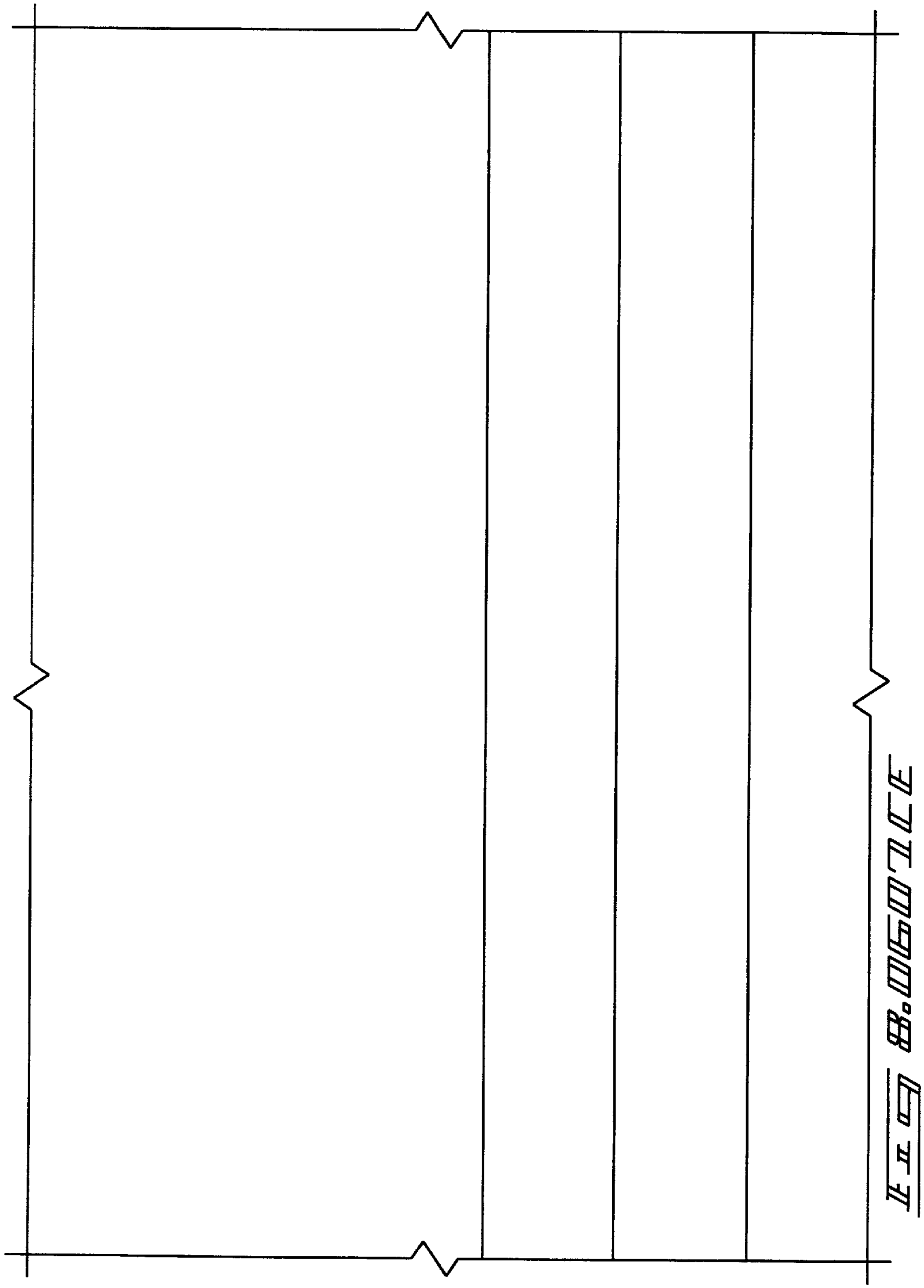
Fig. 8.0607CE

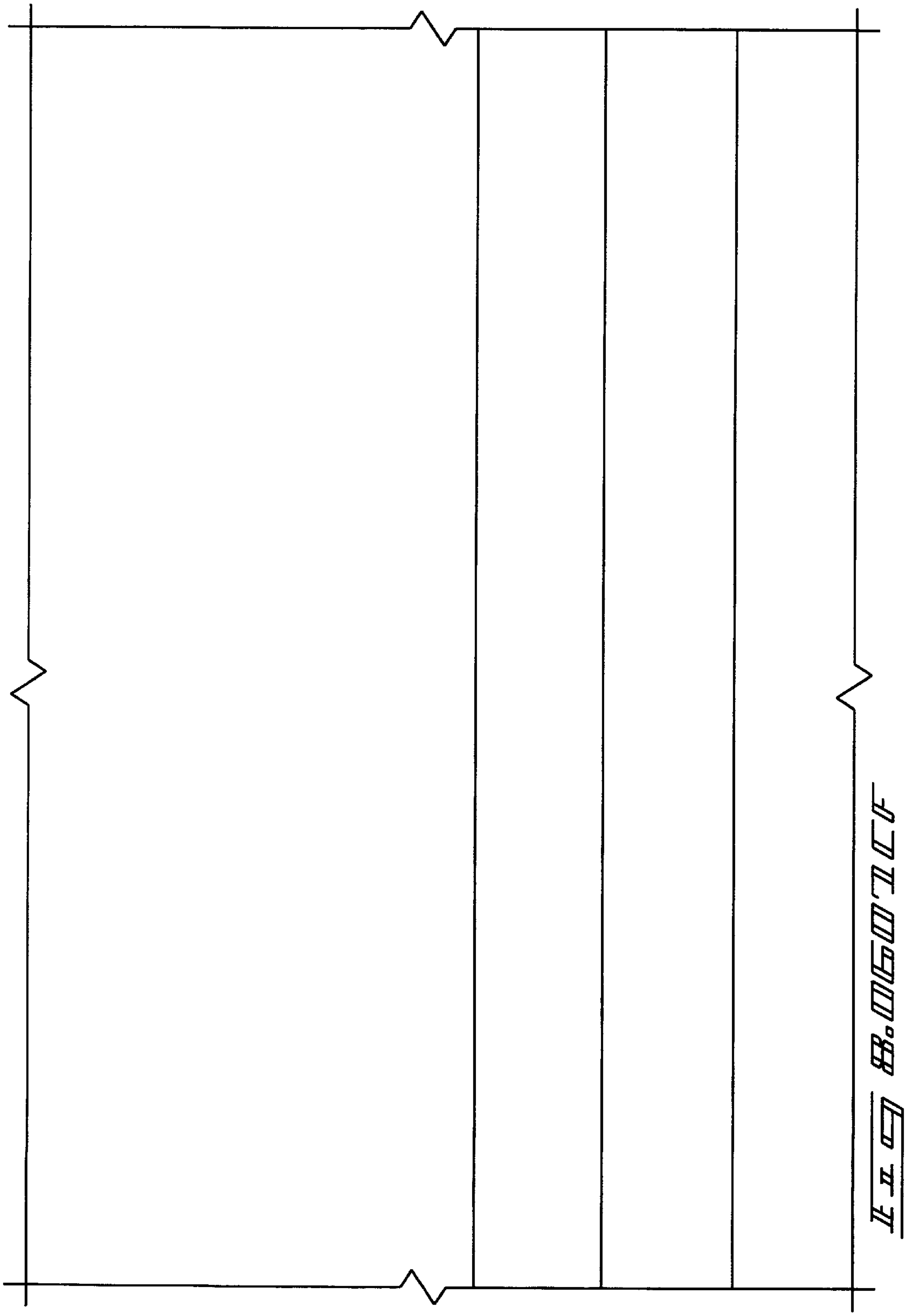
FIG. 8.0607CF

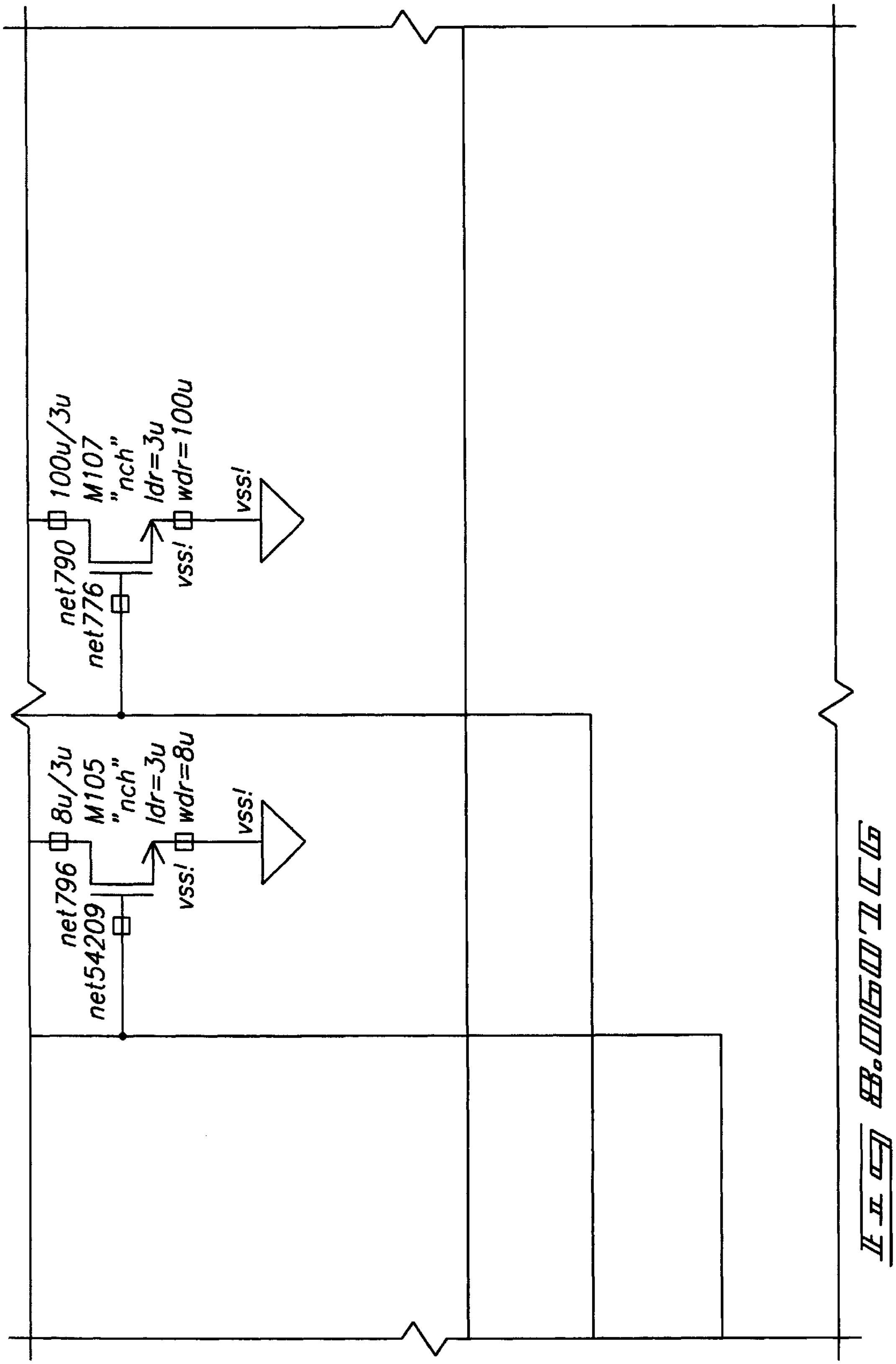
Fig 8.0607CG

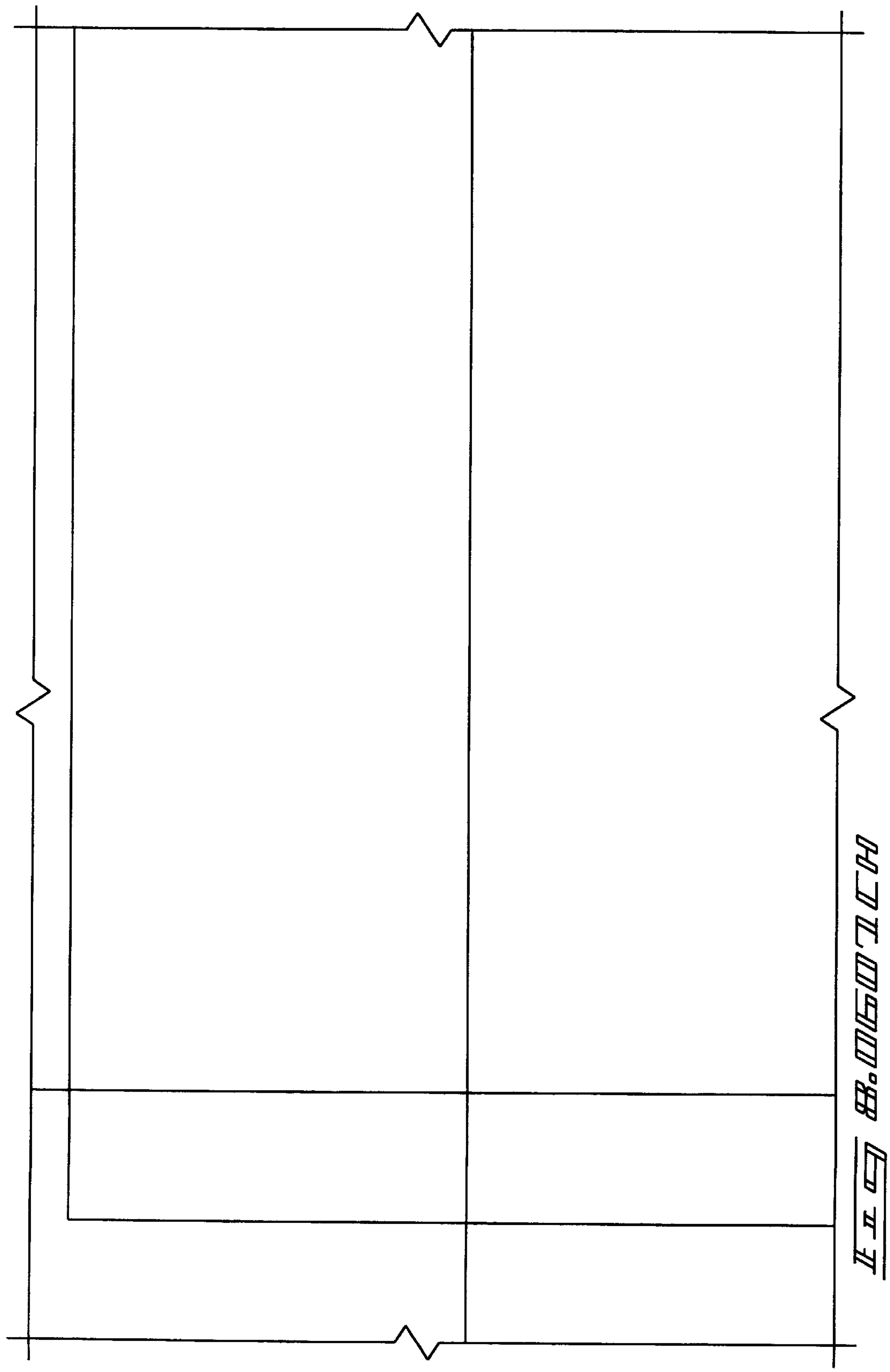
FIG. 8.0607CH

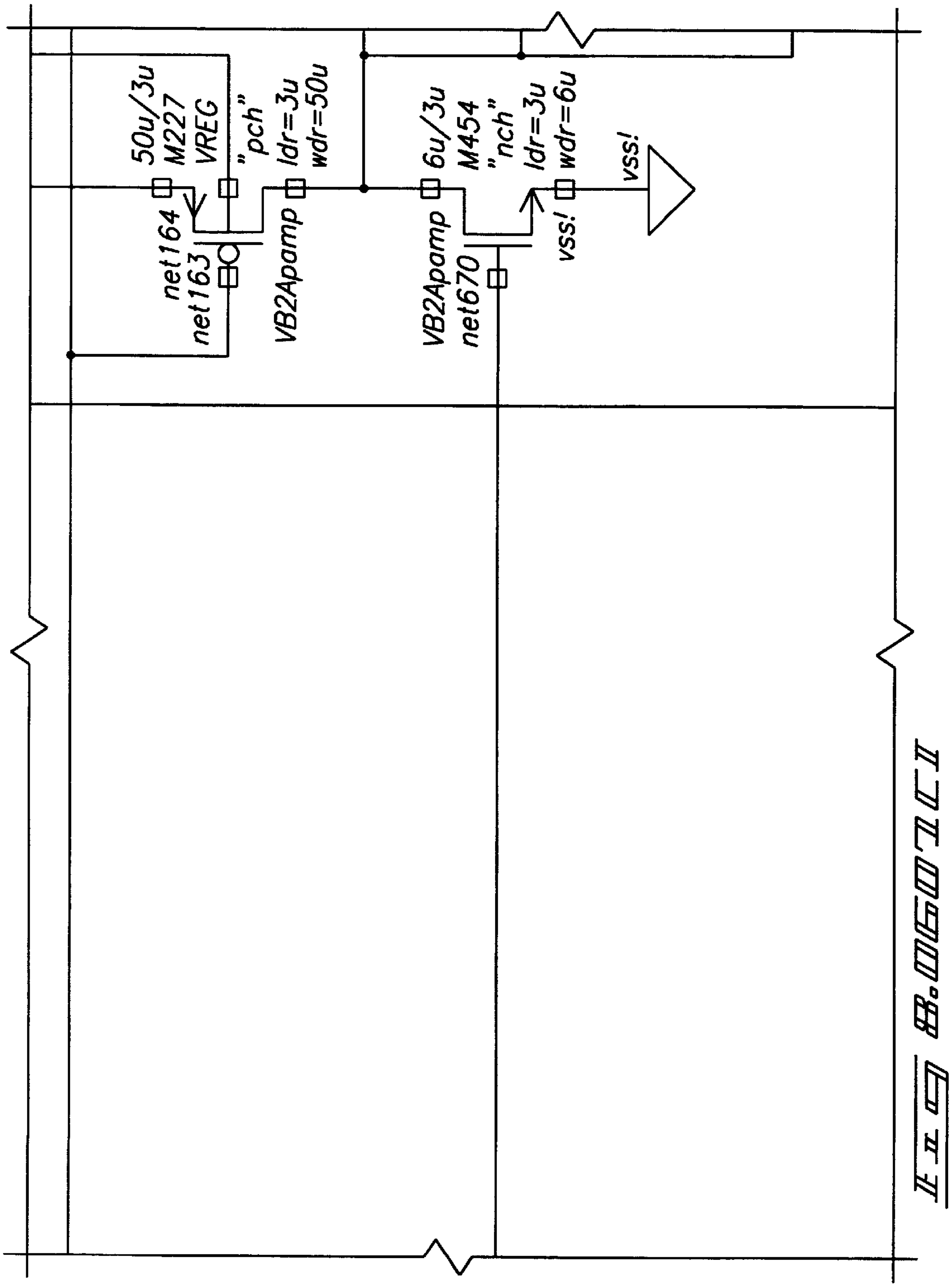
Fig. 8.060ACII

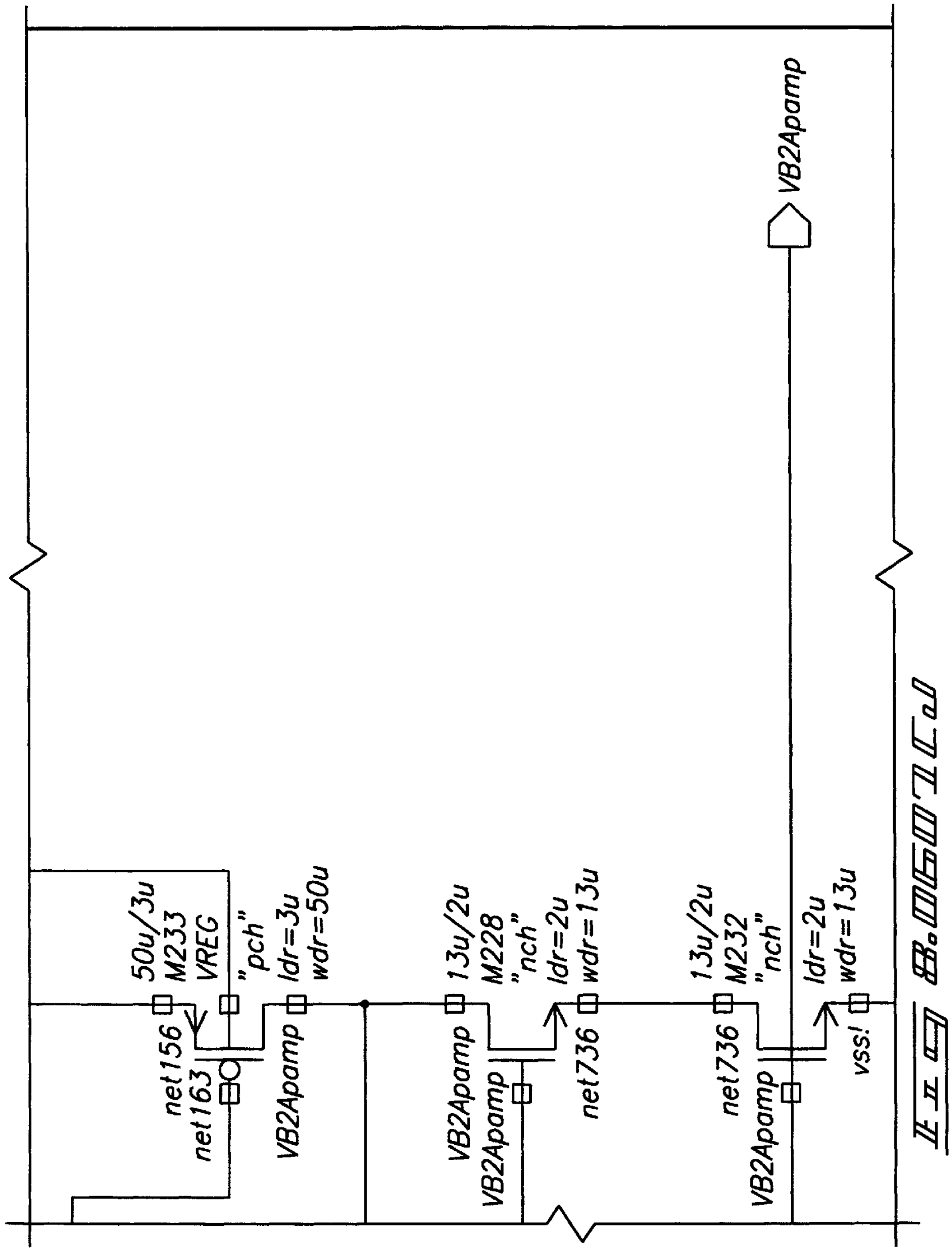
Fig. 8.0607Cd

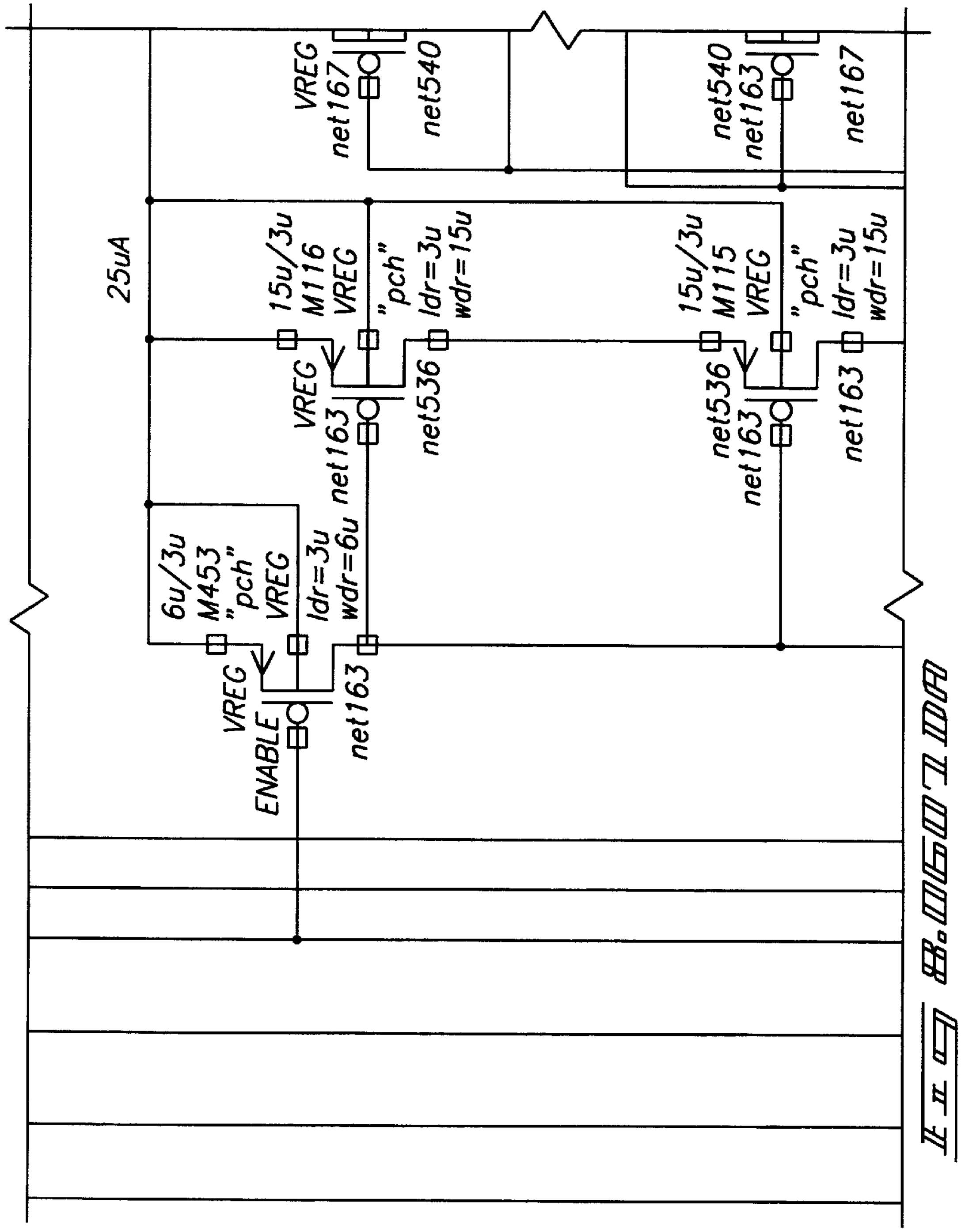
FIG. 8.0607.1DA

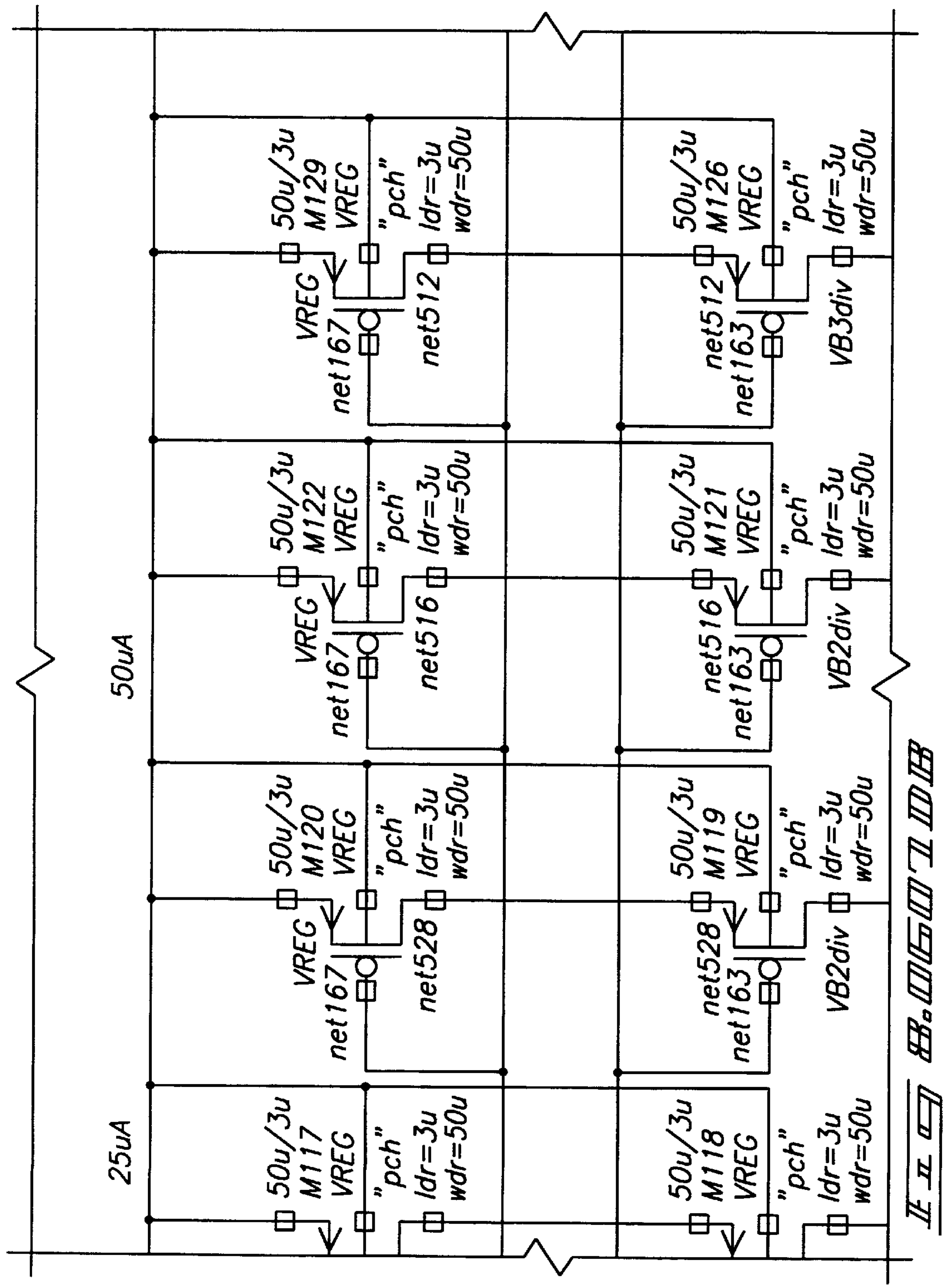
Fig. 8.06010B

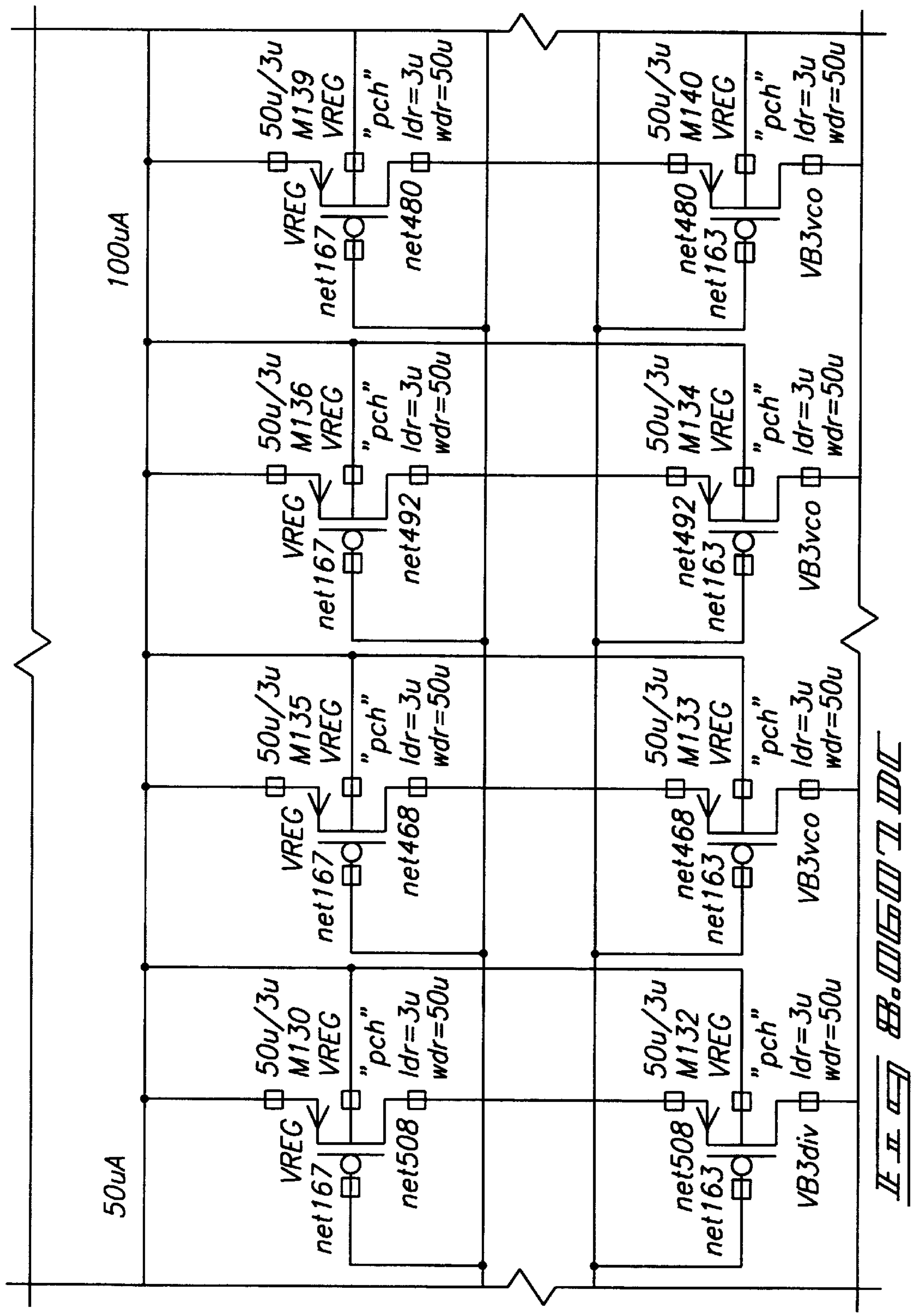
FIG. 8.060IDC

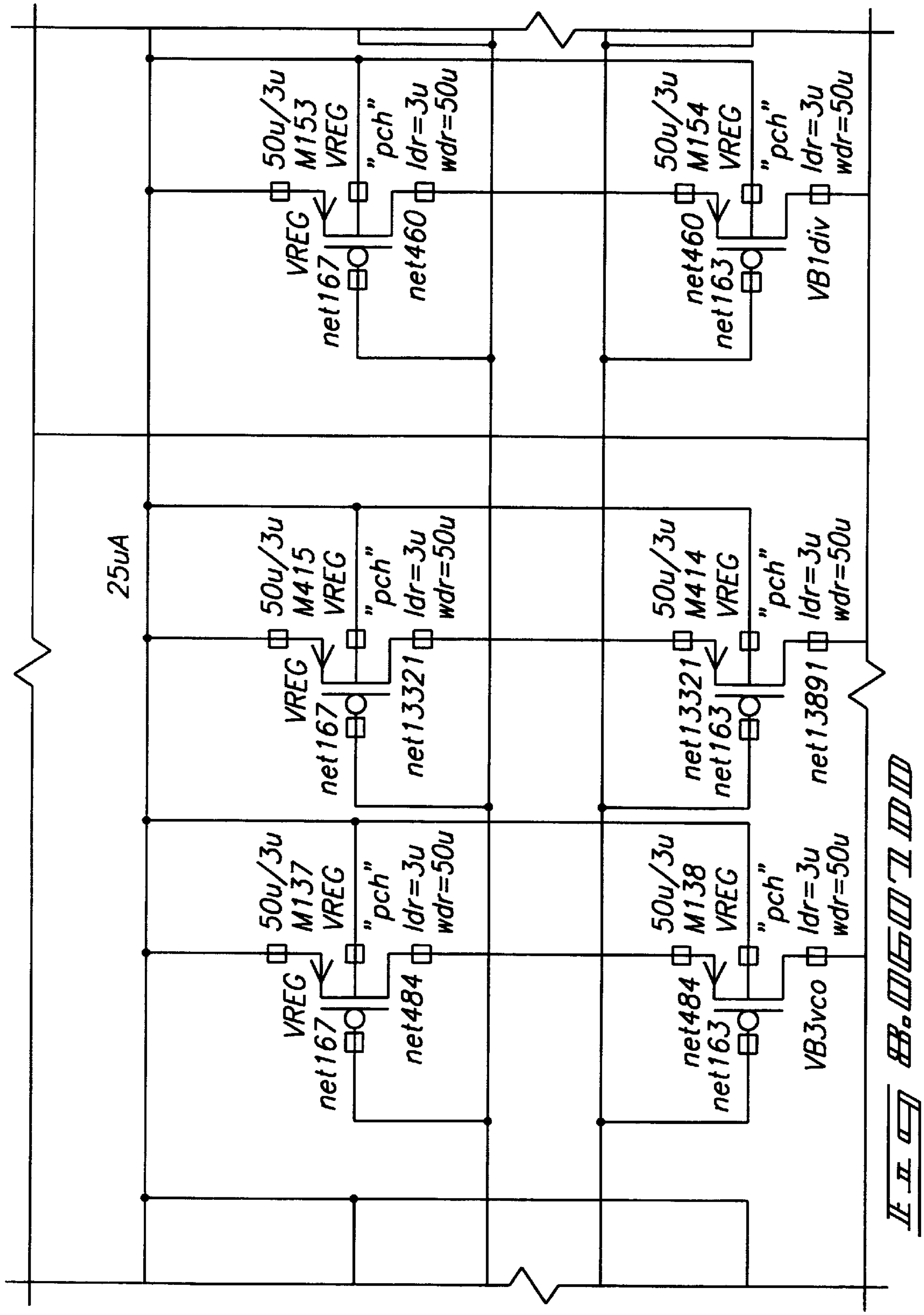
25uA
50u/3u
M153
VREG
"pch"
ldr=3u
wdr=50u
VREG
net167
net460
50u/3u
M154
VREG
"pch"
ldr=3u
wdr=50u
net460
net163
VB1div
50u/3u
M415
VREG
"pch"
ldr=3u
wdr=50u
VREG
net167
net13321
50u/3u
M414
VREG
"pch"
ldr=3u
wdr=50u
net13321
net163
net13891
50u/3u
M137
VREG
"pch"
ldr=3u
wdr=50u
VREG
net167
net484
50u/3u
M138
VREG
"pch"
ldr=3u
wdr=50u
net484
net163
VB3vco

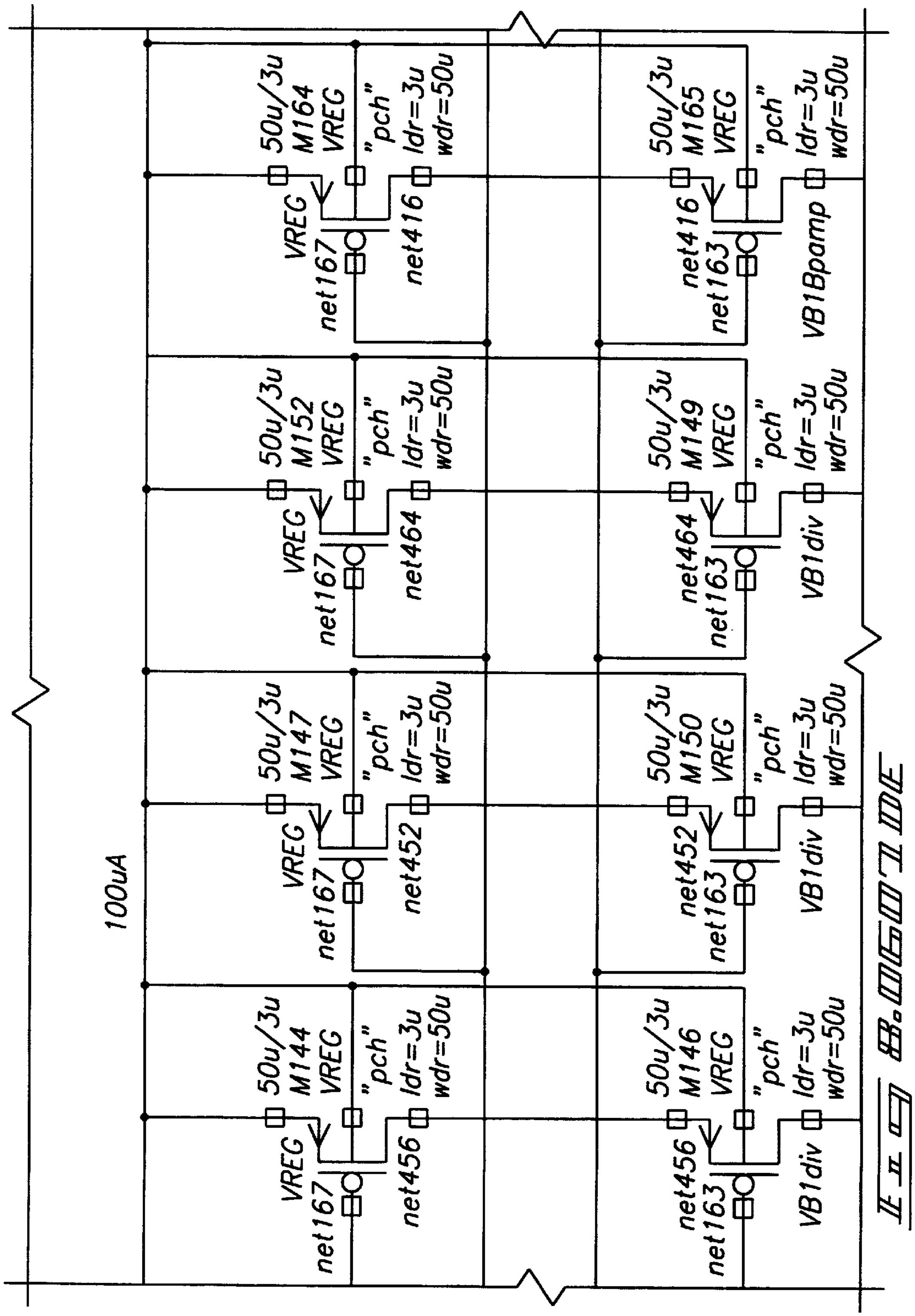
FIG. 8.0607DE

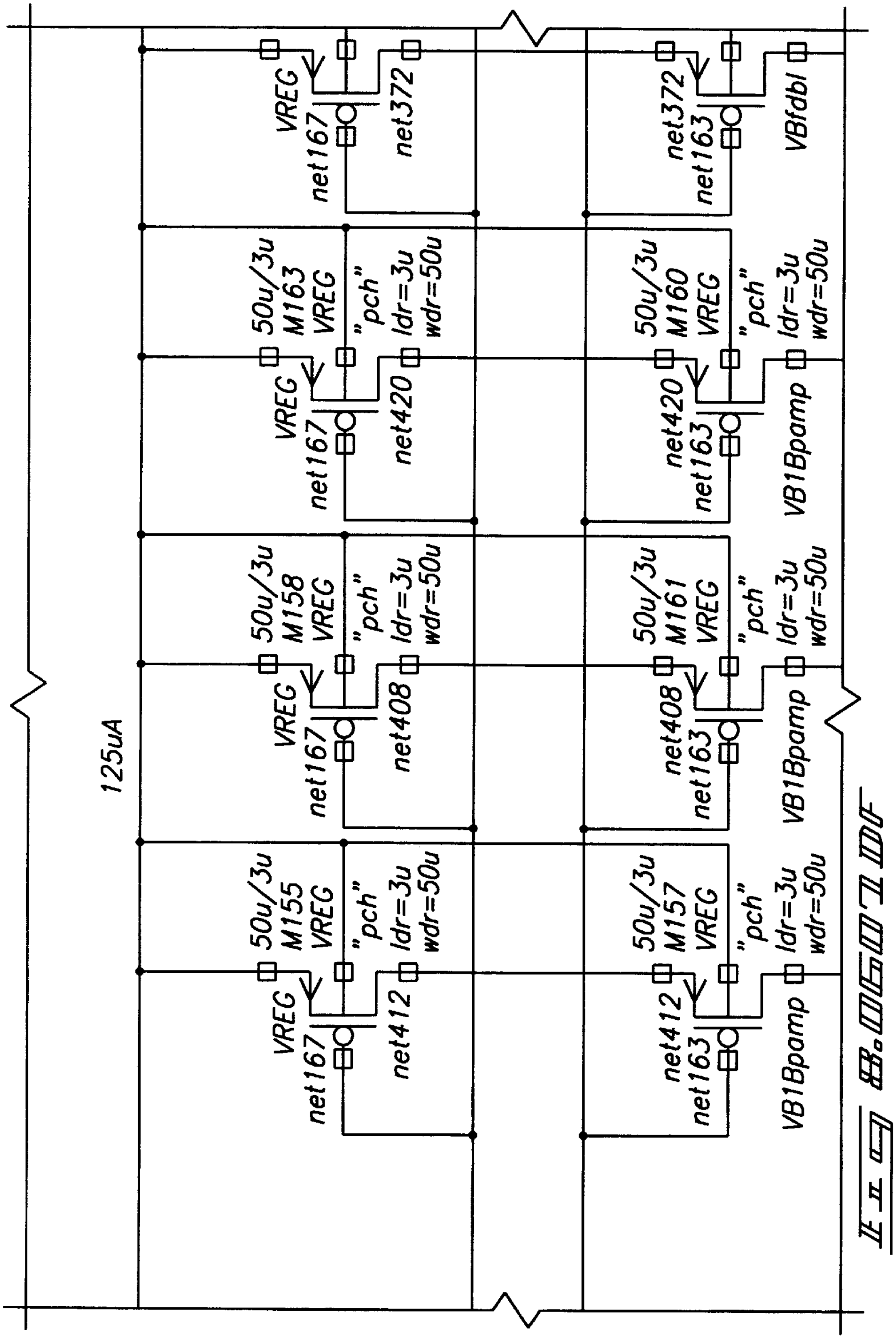
VREG
net167
net372
net372
net163
VBfdbl
50u/3u
M163
VREG
"pch"
ldr=3u
wdr=50u
VREG
net167
net420
50u/3u
M160
VREG
"pch"
ldr=3u
wdr=50u
net420
net163
VB1Bpamp
50u/3u
M158
VREG
"pch"
ldr=3u
wdr=50u
VREG
net167
net408
50u/3u
M161
VREG
"pch"
ldr=3u
wdr=50u
net408
net163
VB1Bpamp
125uA
50u/3u
M155
VREG
"pch"
ldr=3u
wdr=50u
VREG
net167
net412
50u/3u
M157
VREG
"pch"
ldr=3u
wdr=50u
net412
net163
VB1Bpamp

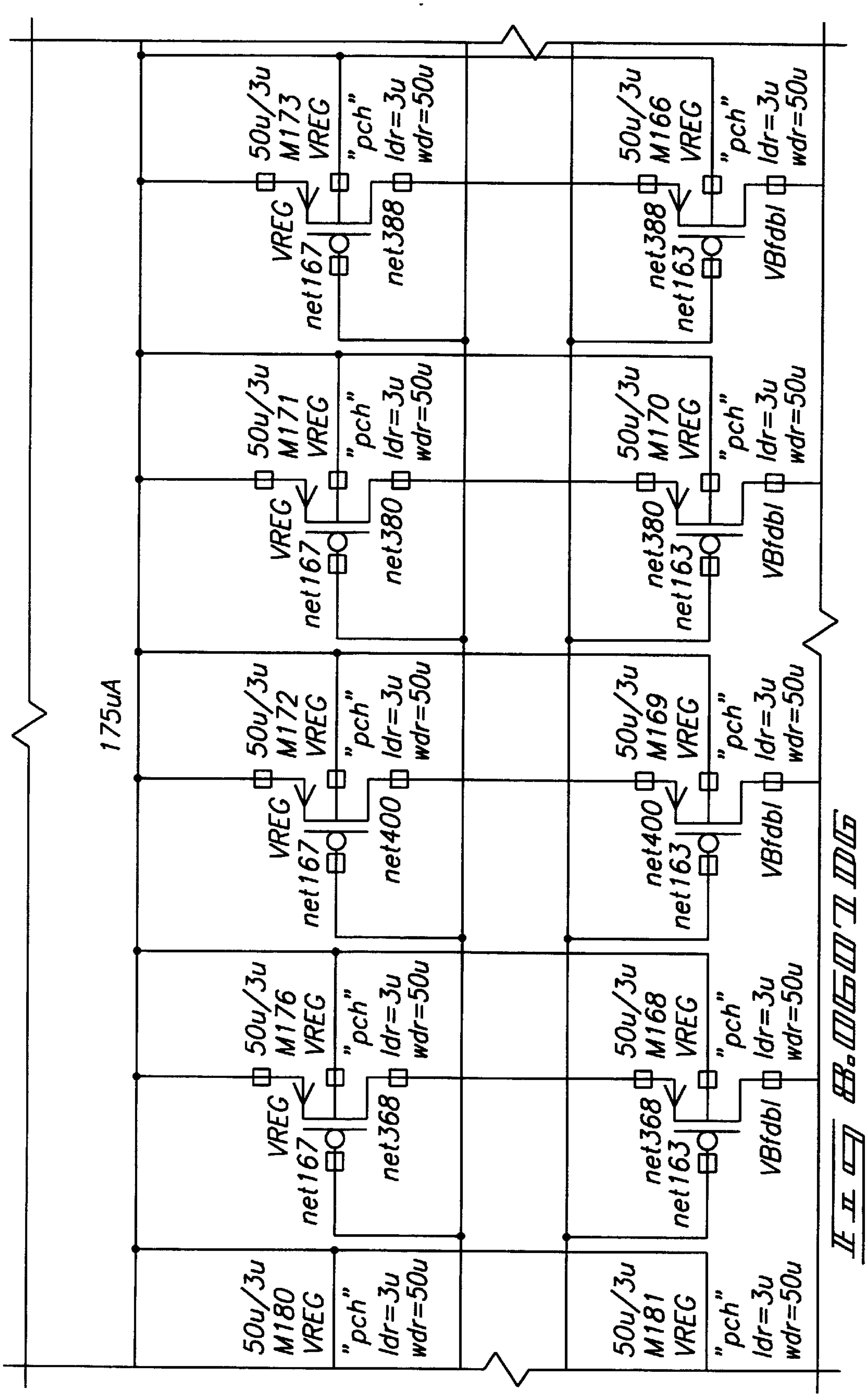
FIG. 8.MGO7.DG

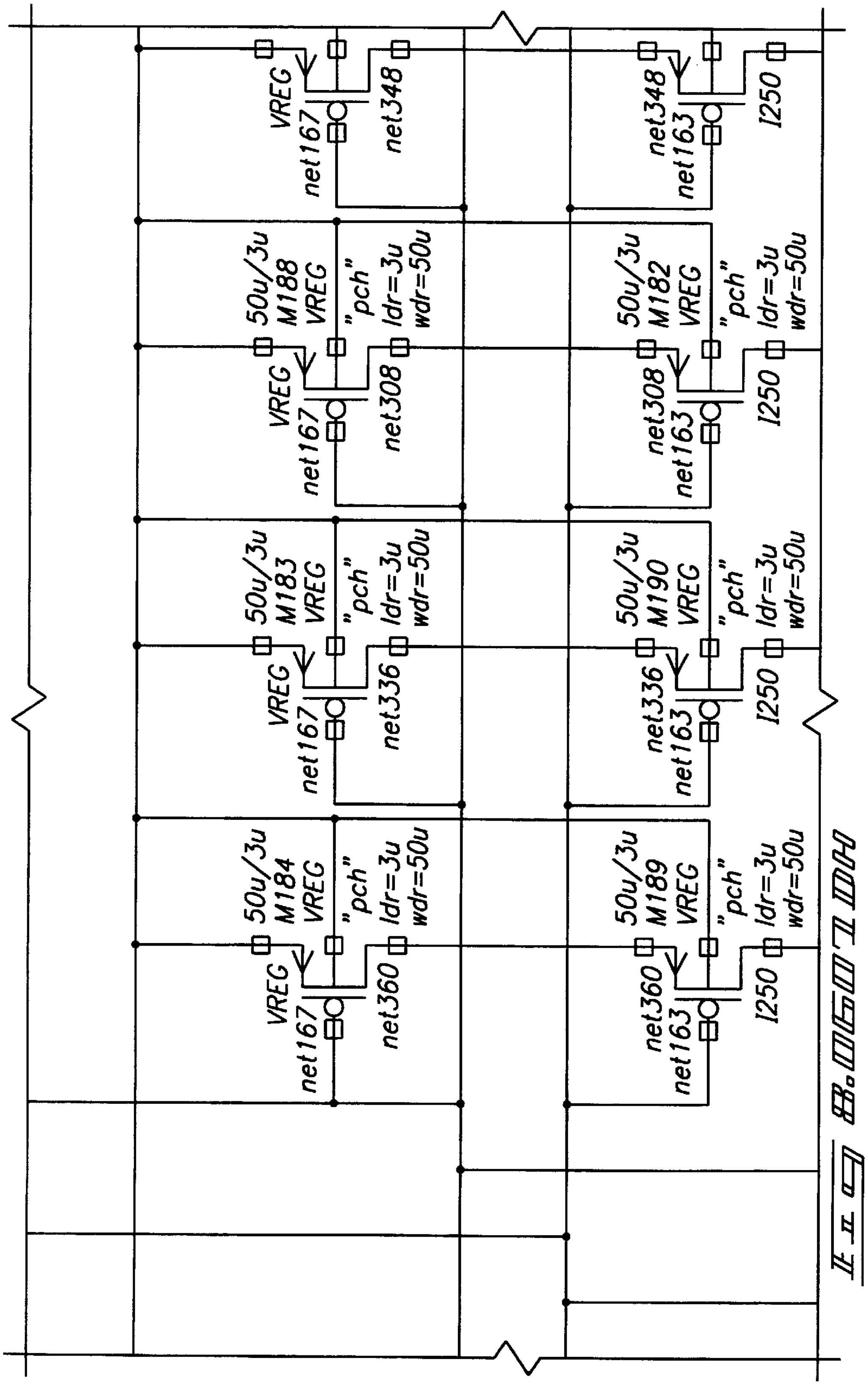
FIG. 8.0607DH

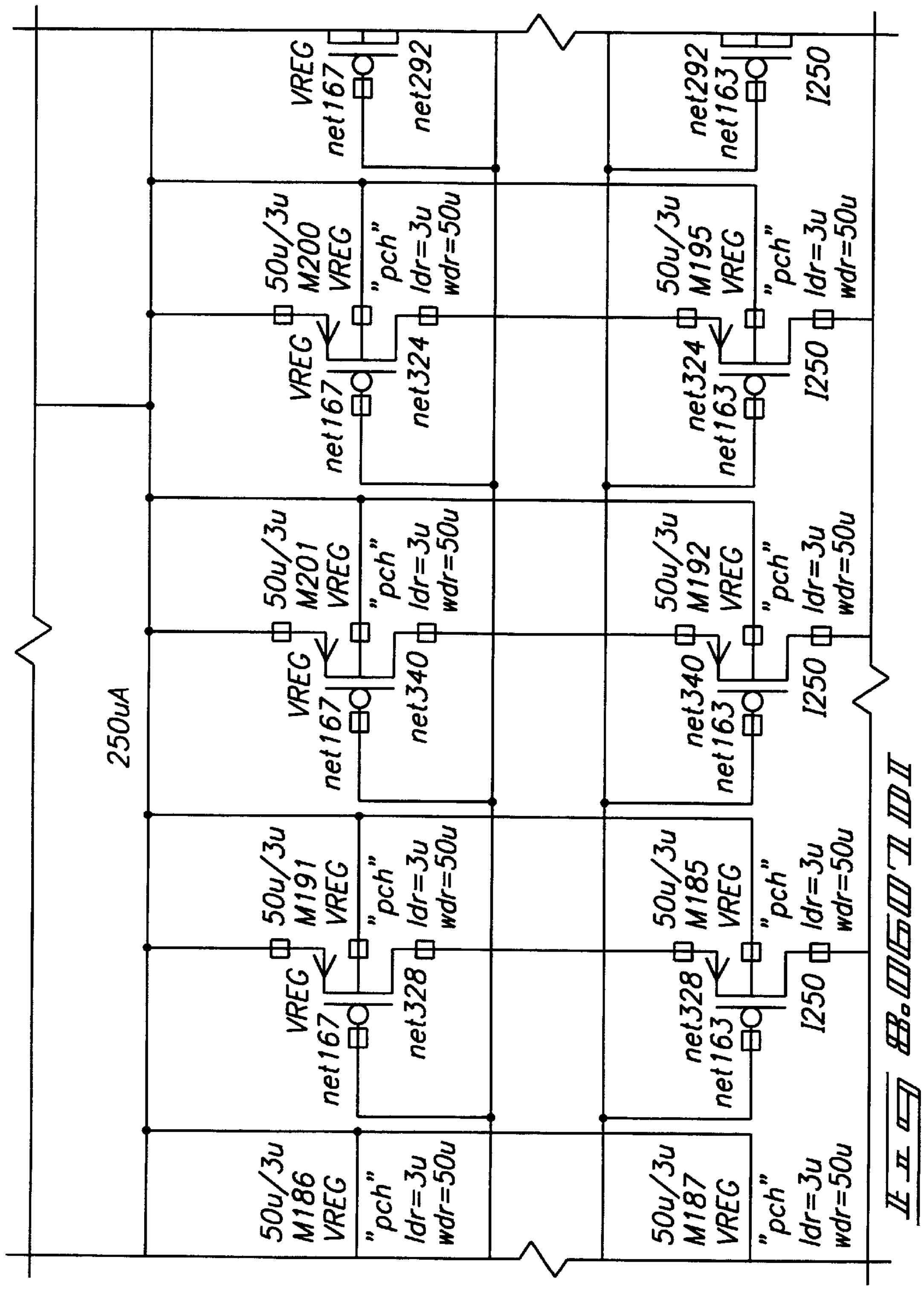
250uA
VREG
net167
net292
net163
I250
50u/3u
M200
M195
M201
M192
M191
M185
M186
M187
"pch"
ldr=3u
wdr=50u
net324
net340
net328

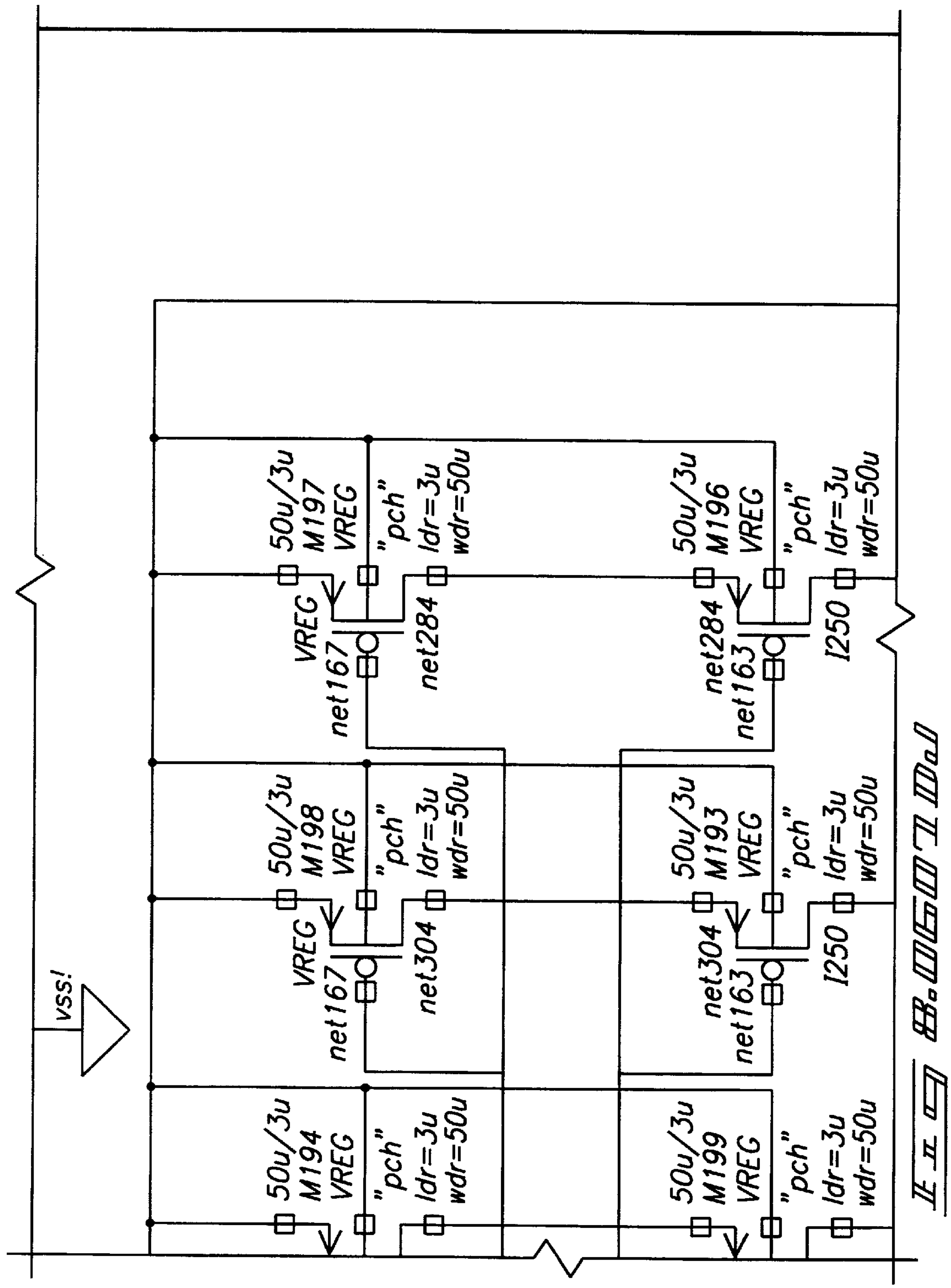
Fig. 8.0607M.J

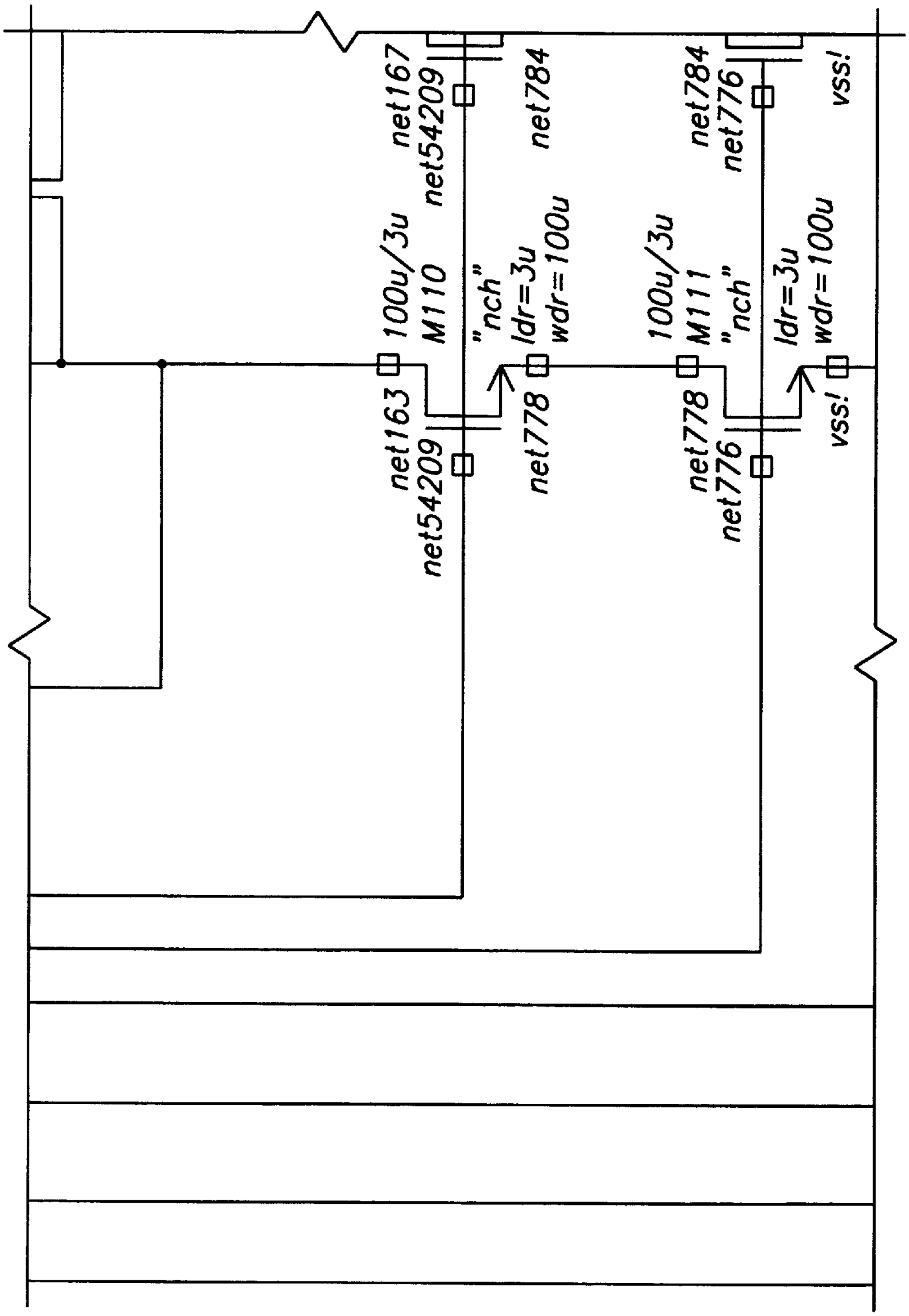
FIG. 8.0060TEA

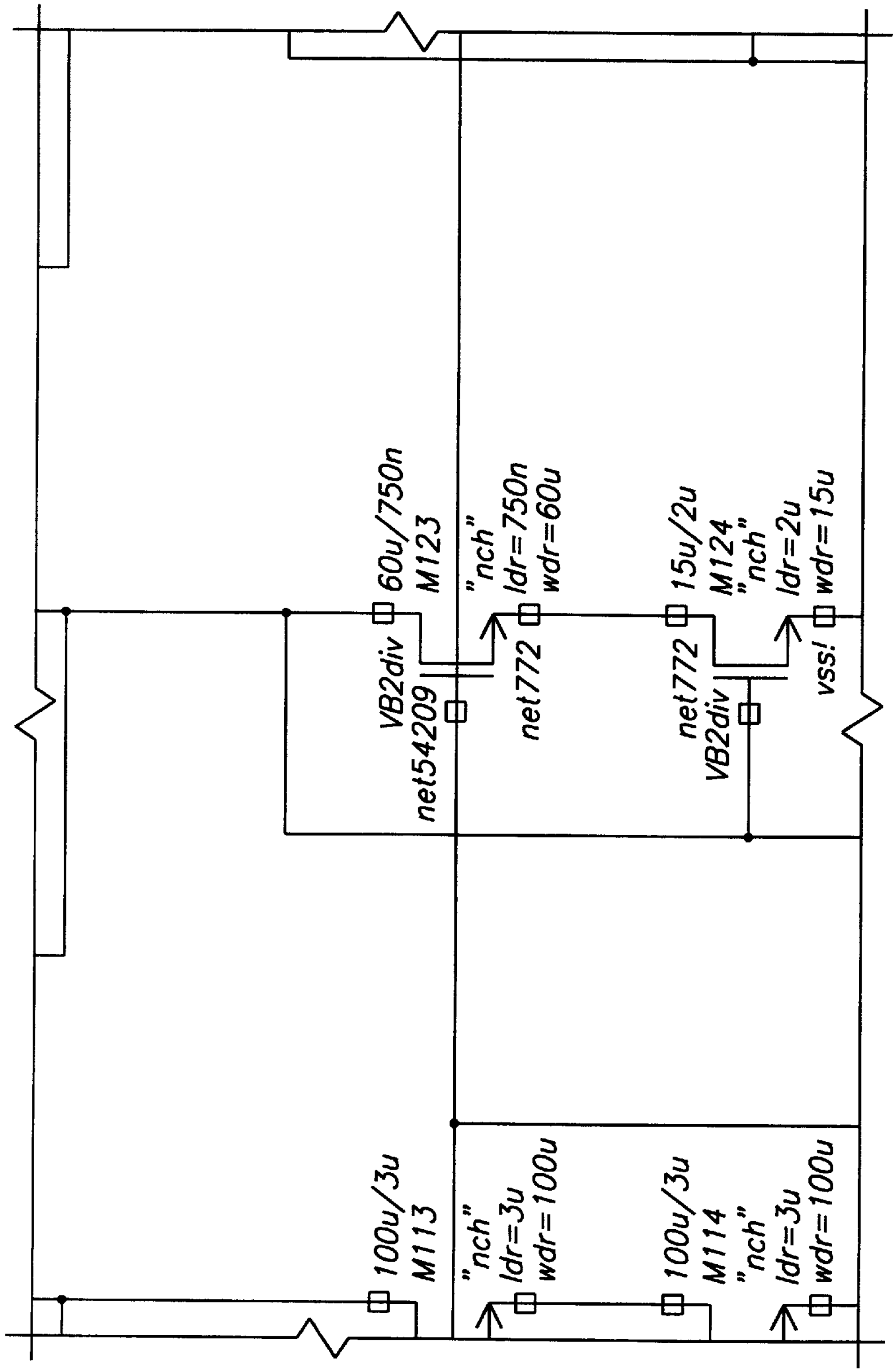
FIG. 8.0607E.B

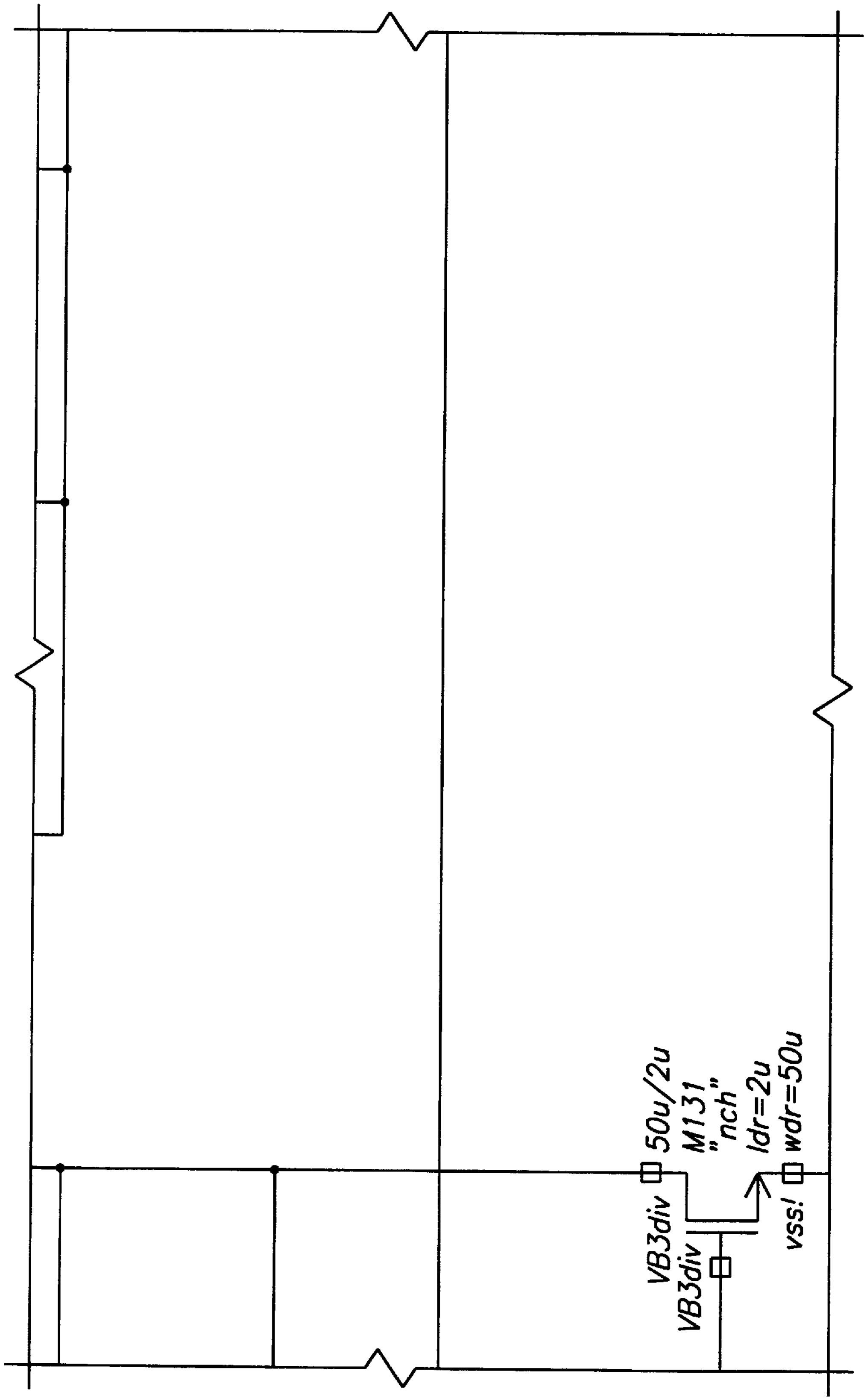
FIG. 8.0G07EC

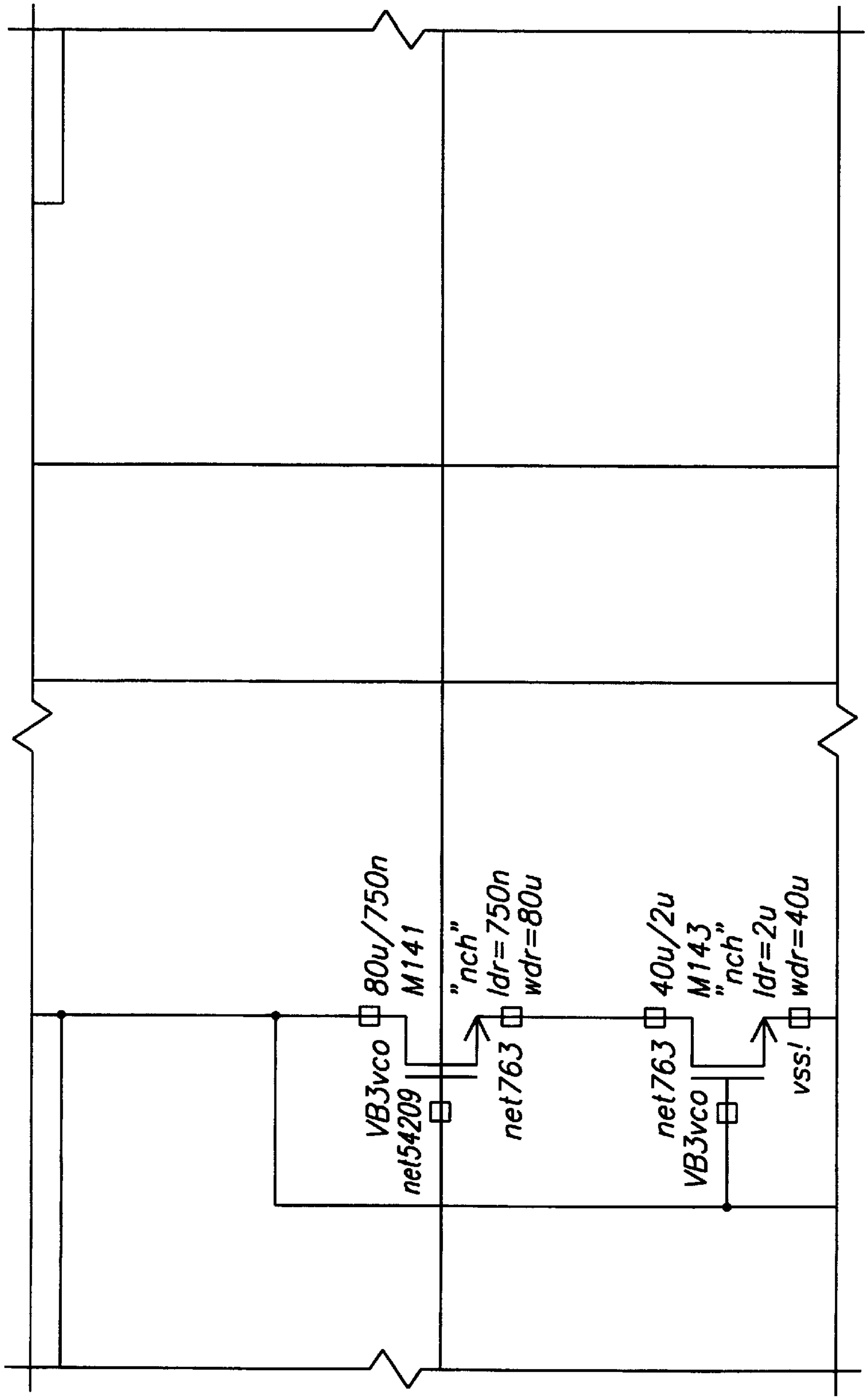
FIG. 8.0607ED

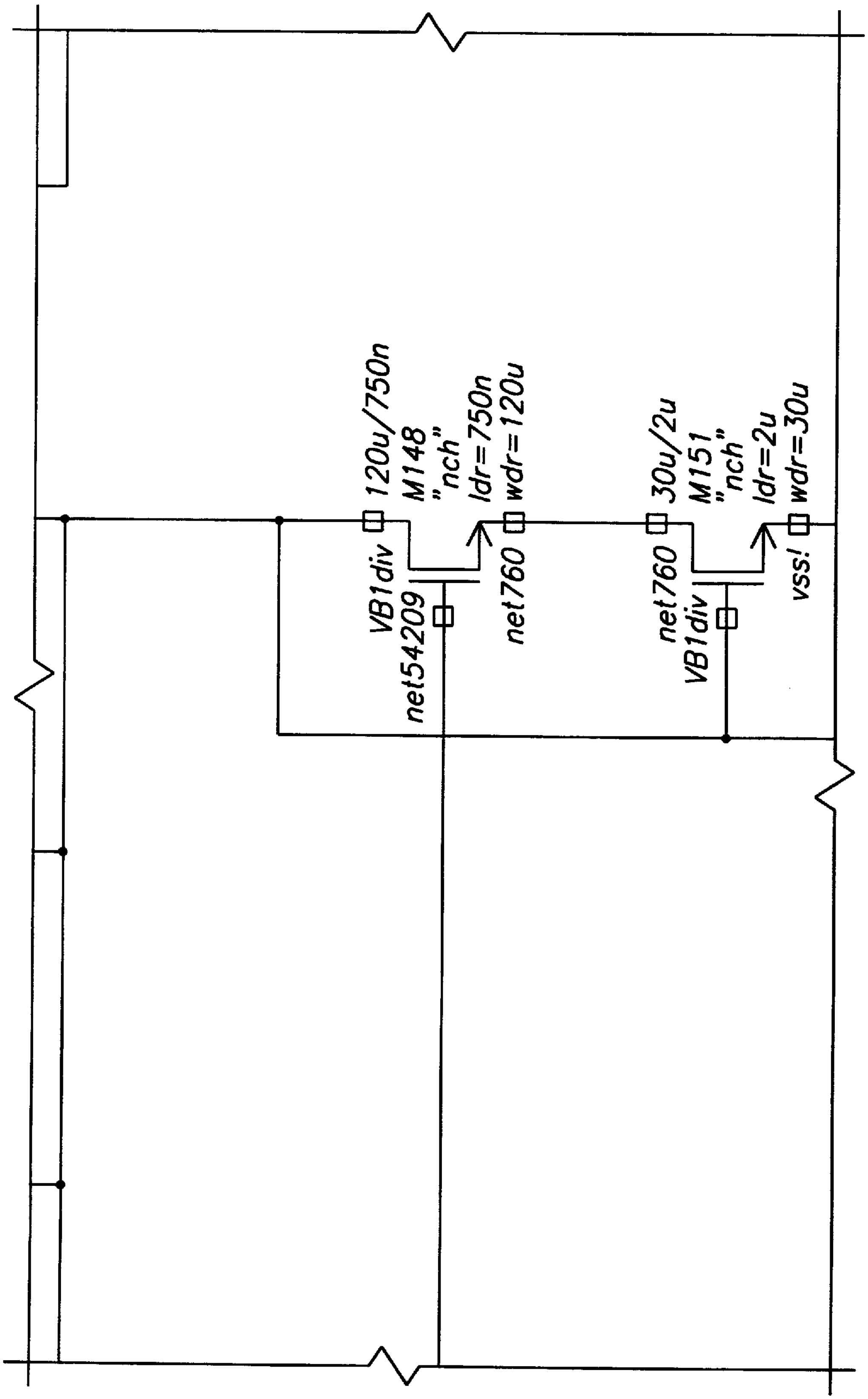
FIG. 8.0607EE

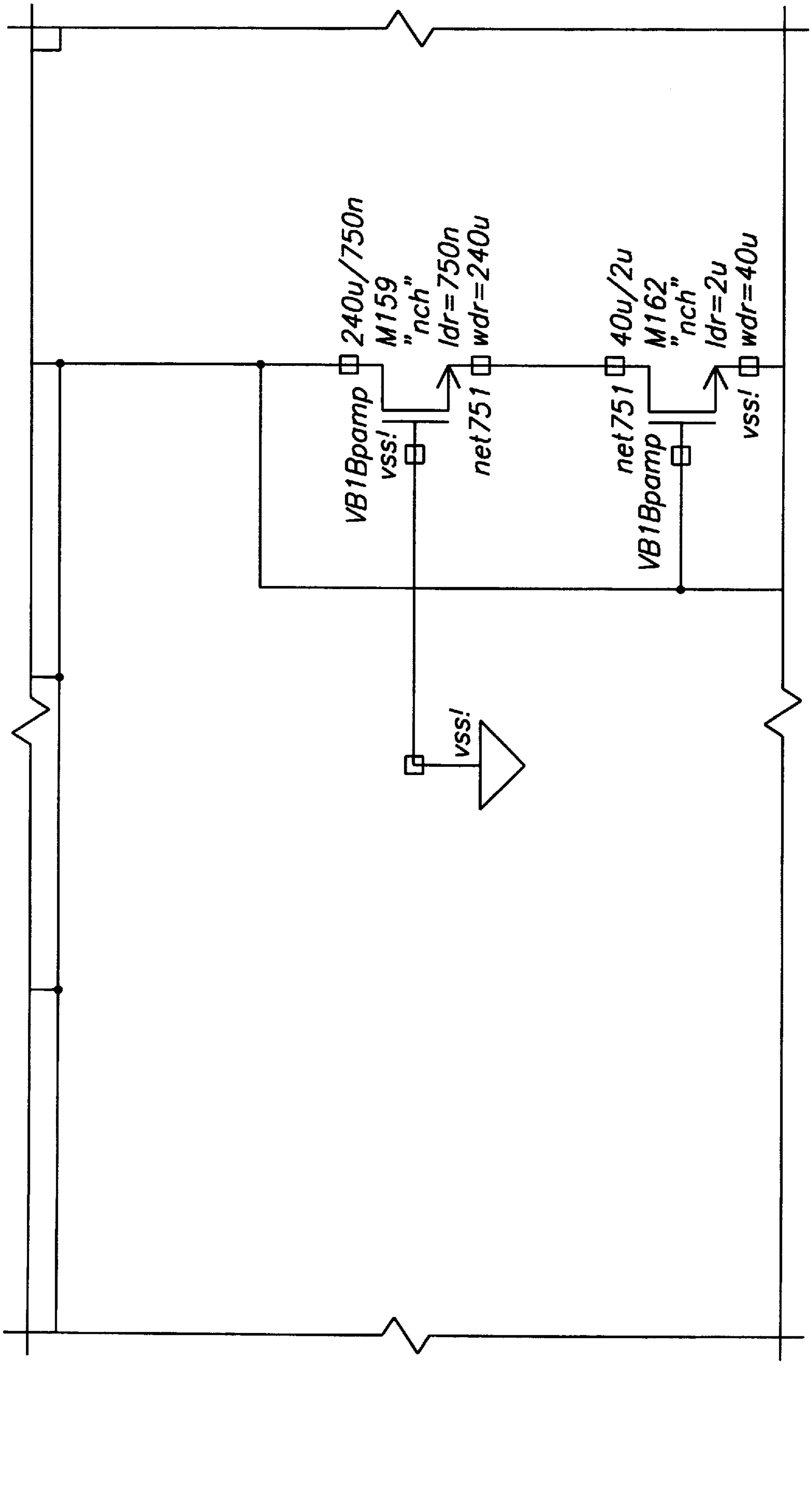
240u/750n
M159
"nch"
ldr=750n
wdr=240u
VB1Bpamp
vss!
net751
40u/2u
M162
"nch"
ldr=2u
wdr=40u
net751
VB1Bpamp
vss!
vss!

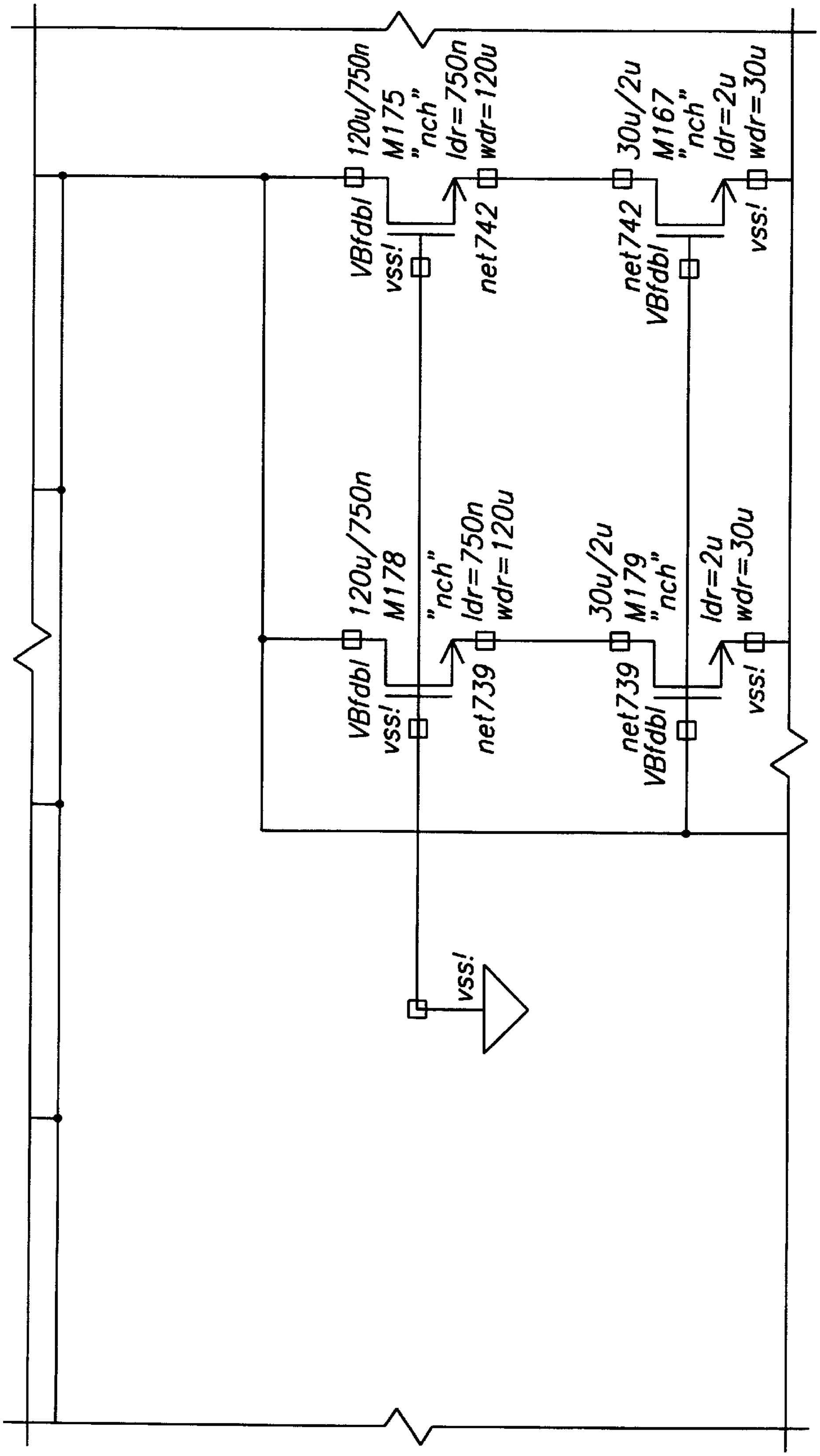
FIG. 8.0607EG

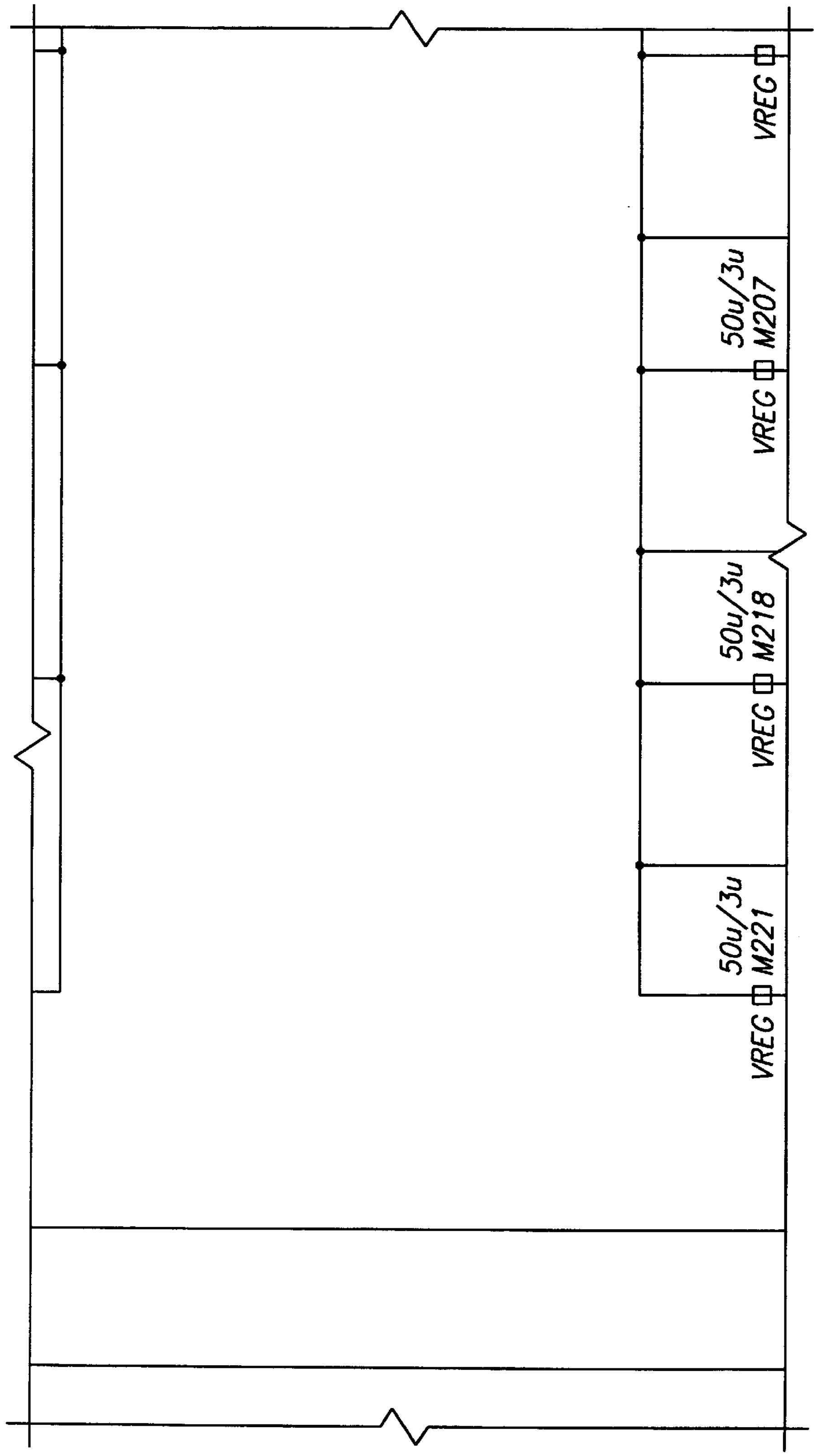
FIG. 8.0607EH

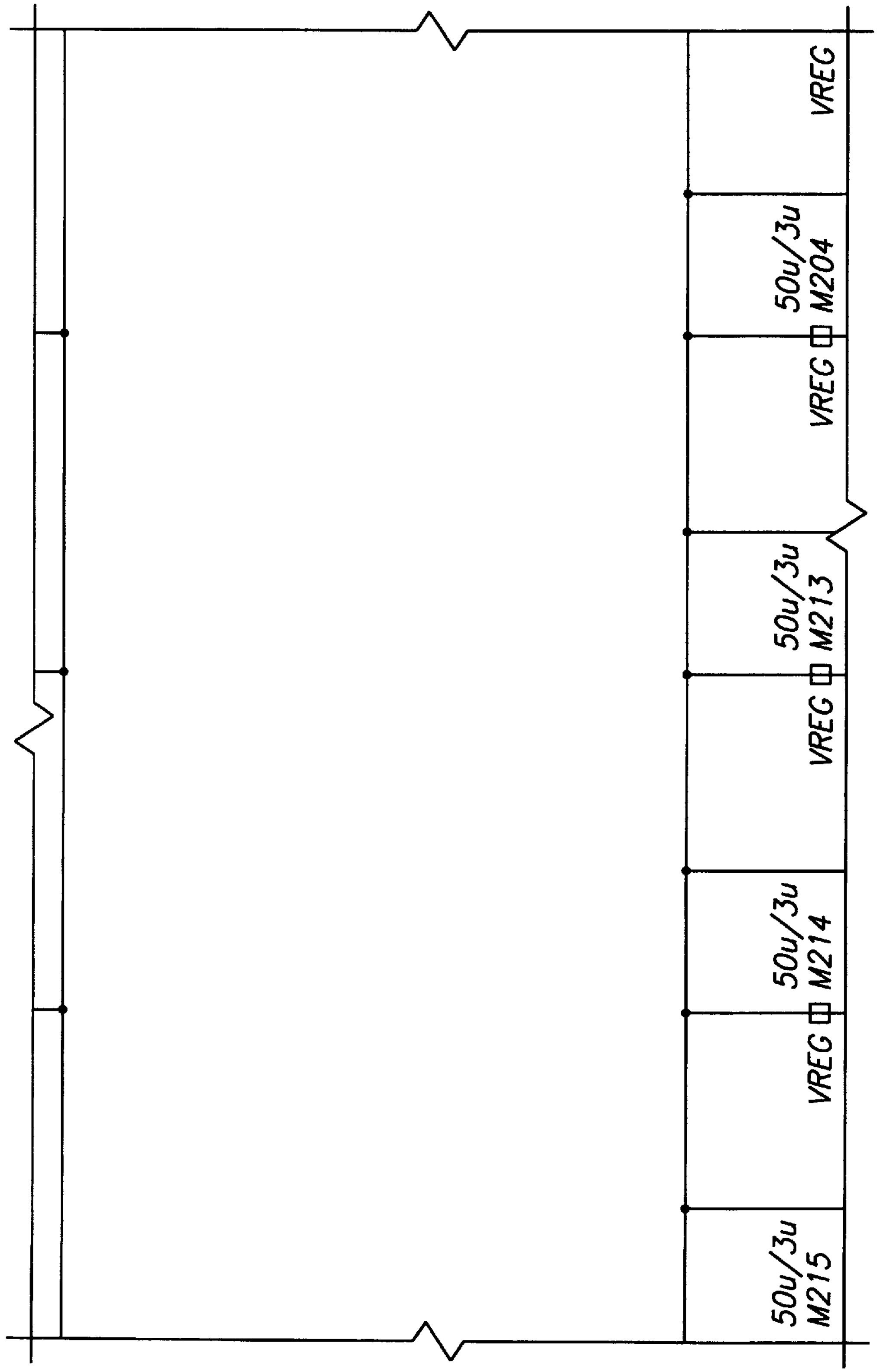
Fig. 8.DGD7EI

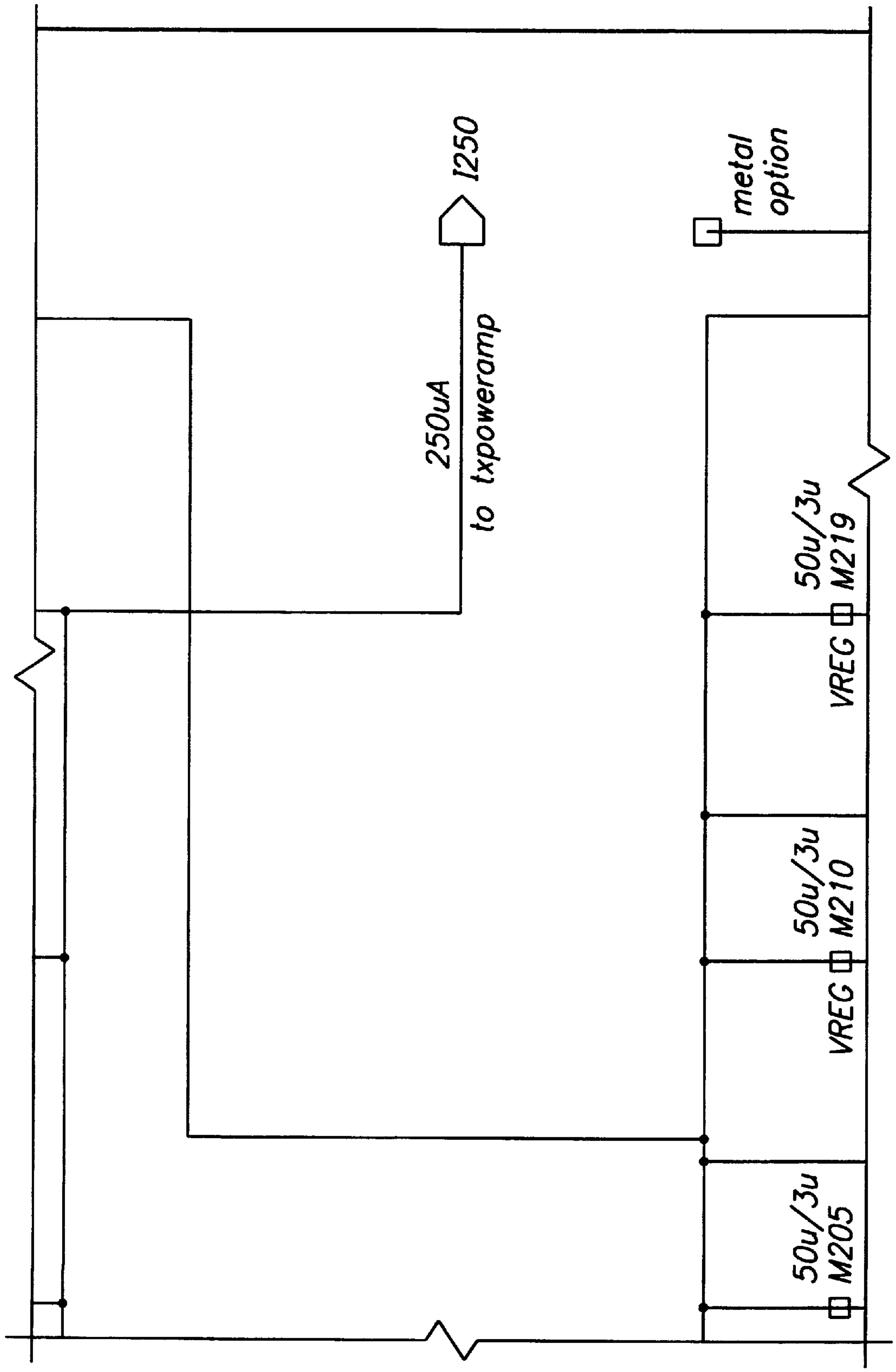
FIG 8.DGOTEJ

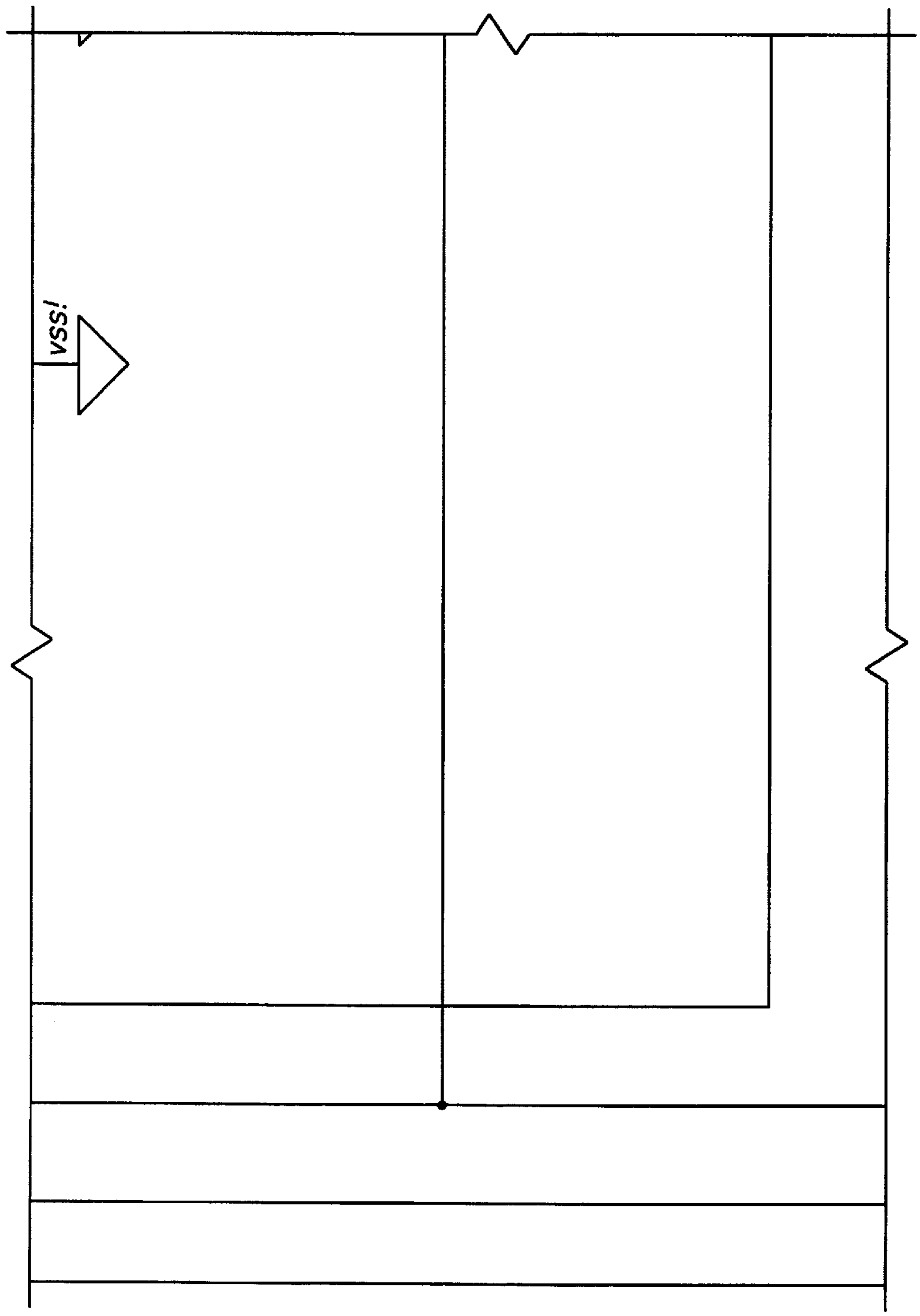
Fig. 8.0607FA

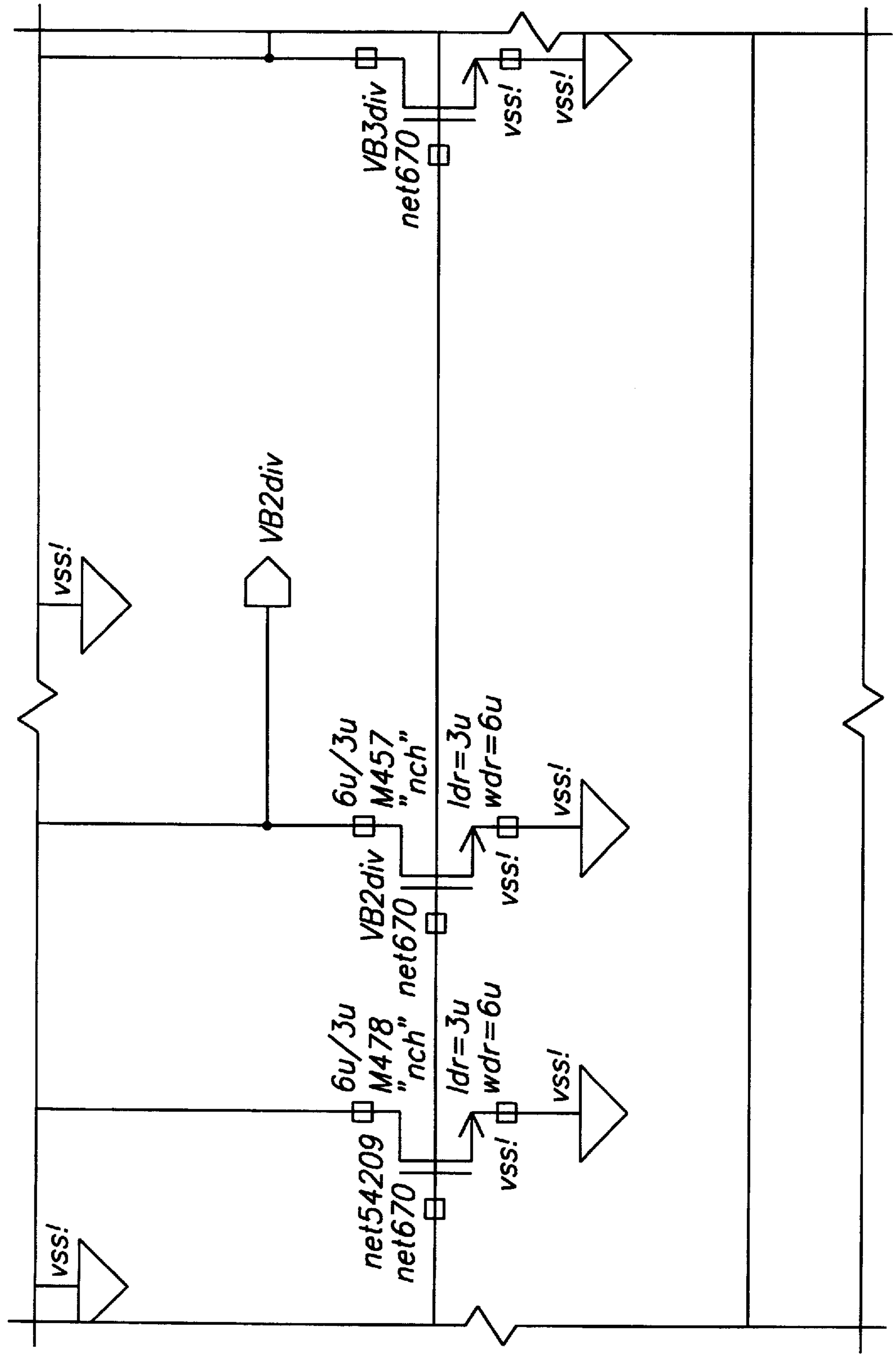
VB3div
net670
vss!
vss!
VB2div
vss!
6u/3u
M457
"nch"
VB2div
net670
ldr=3u
wdr=6u
vss!
vss!
6u/3u
M478
"nch"
net54209
net670
ldr=3u
wdr=6u
vss!
vss!
vss!

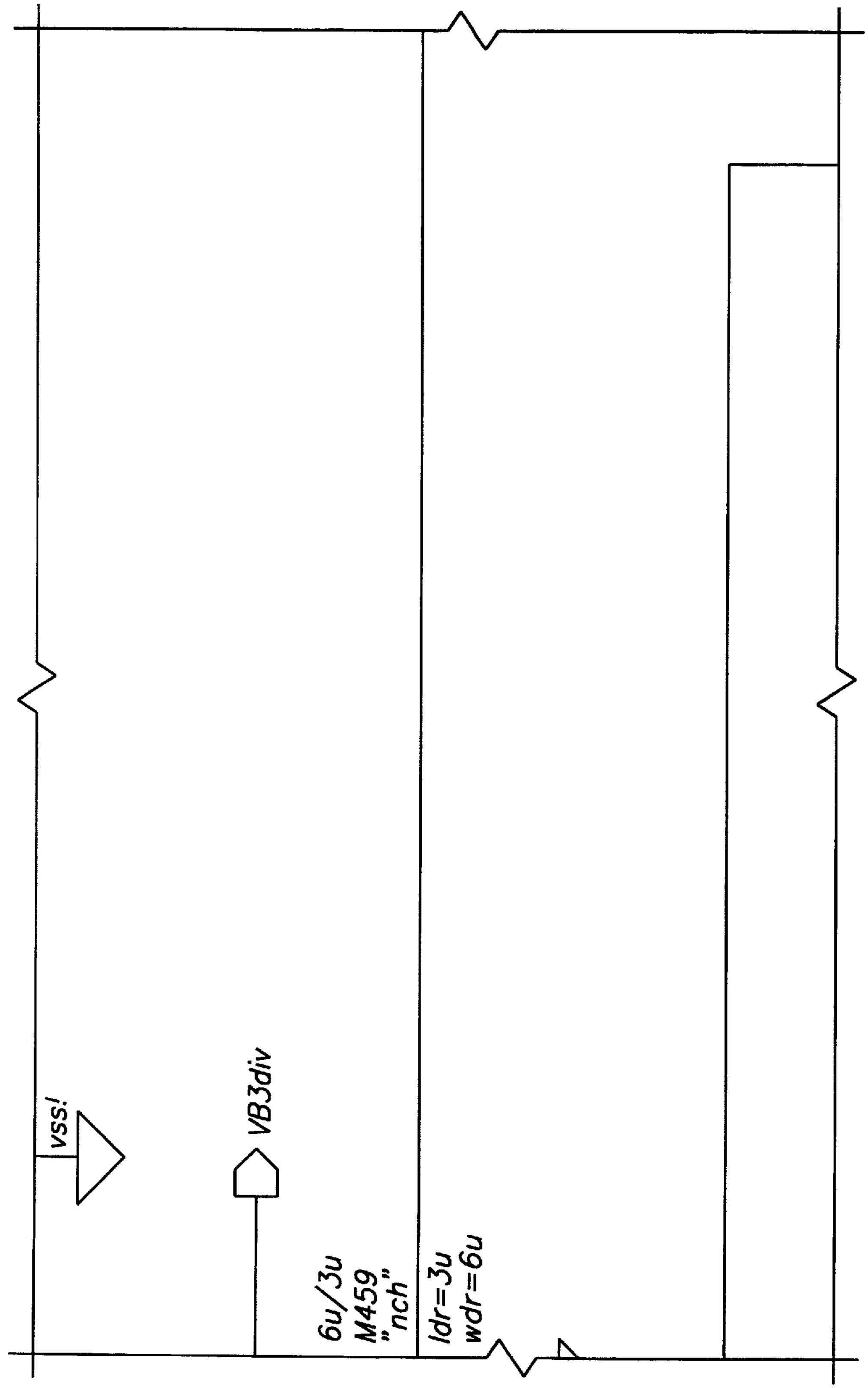
FIG. 8.0607FC

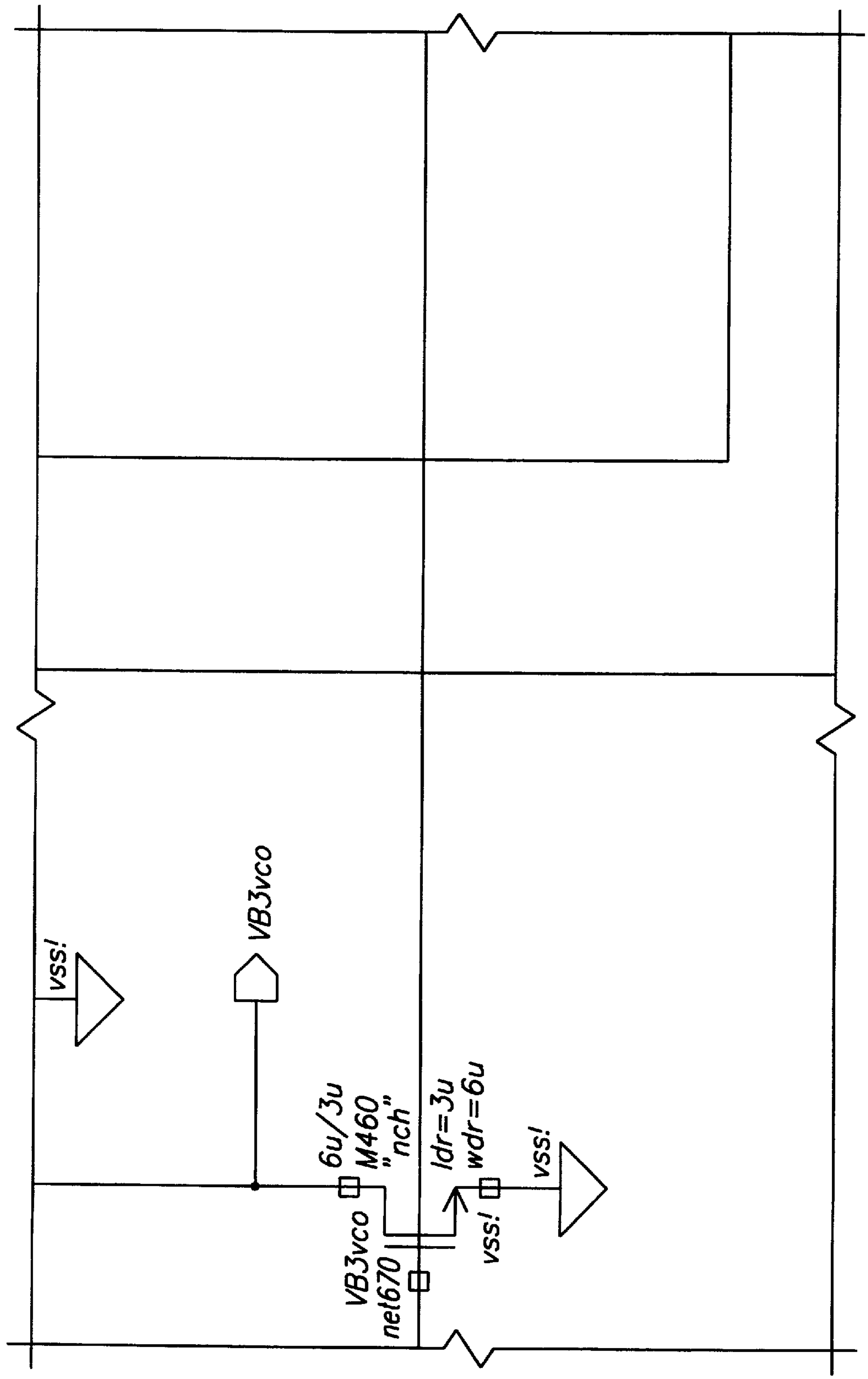
Fig. 8.0607FD

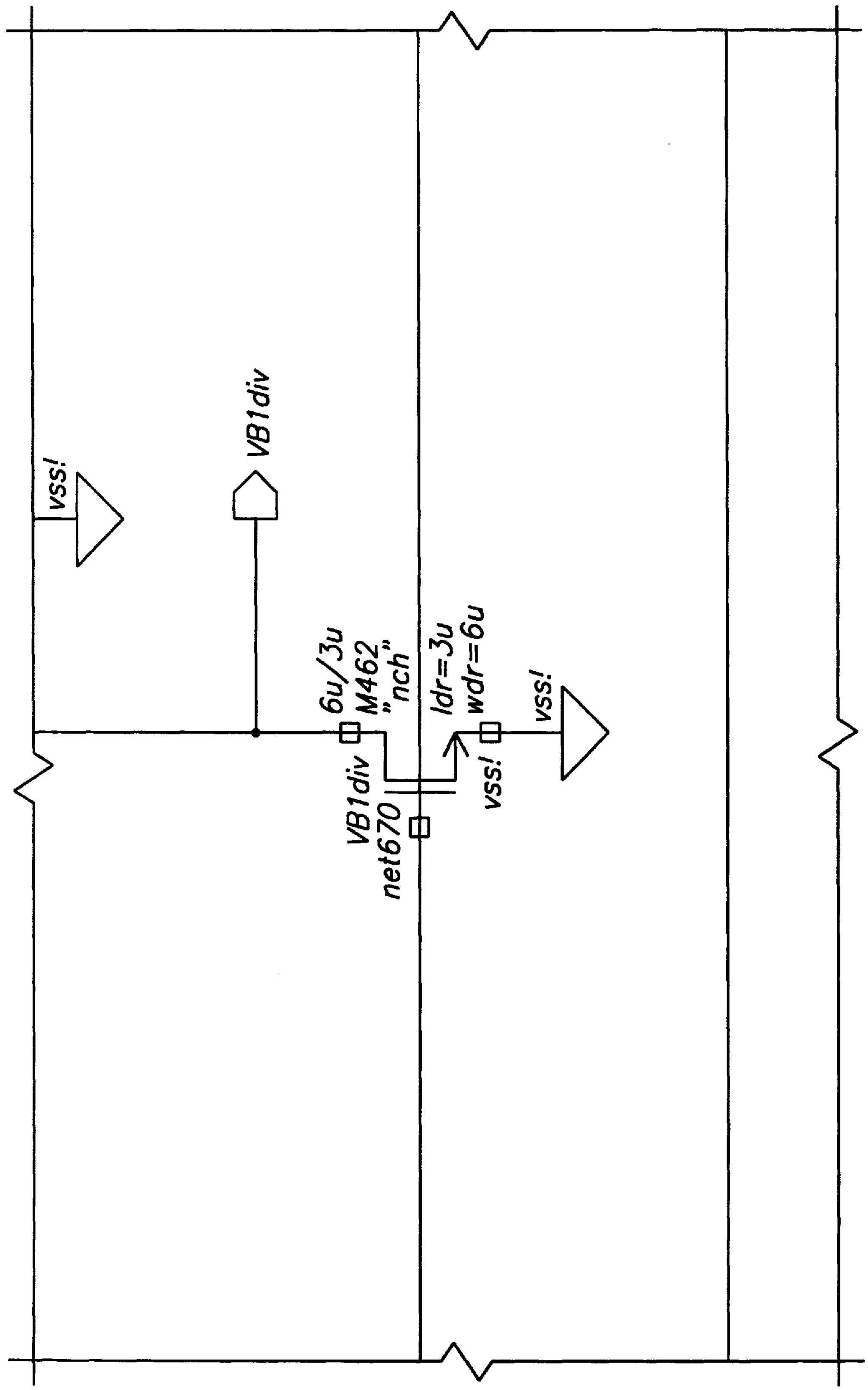
FIG 8.060TFE

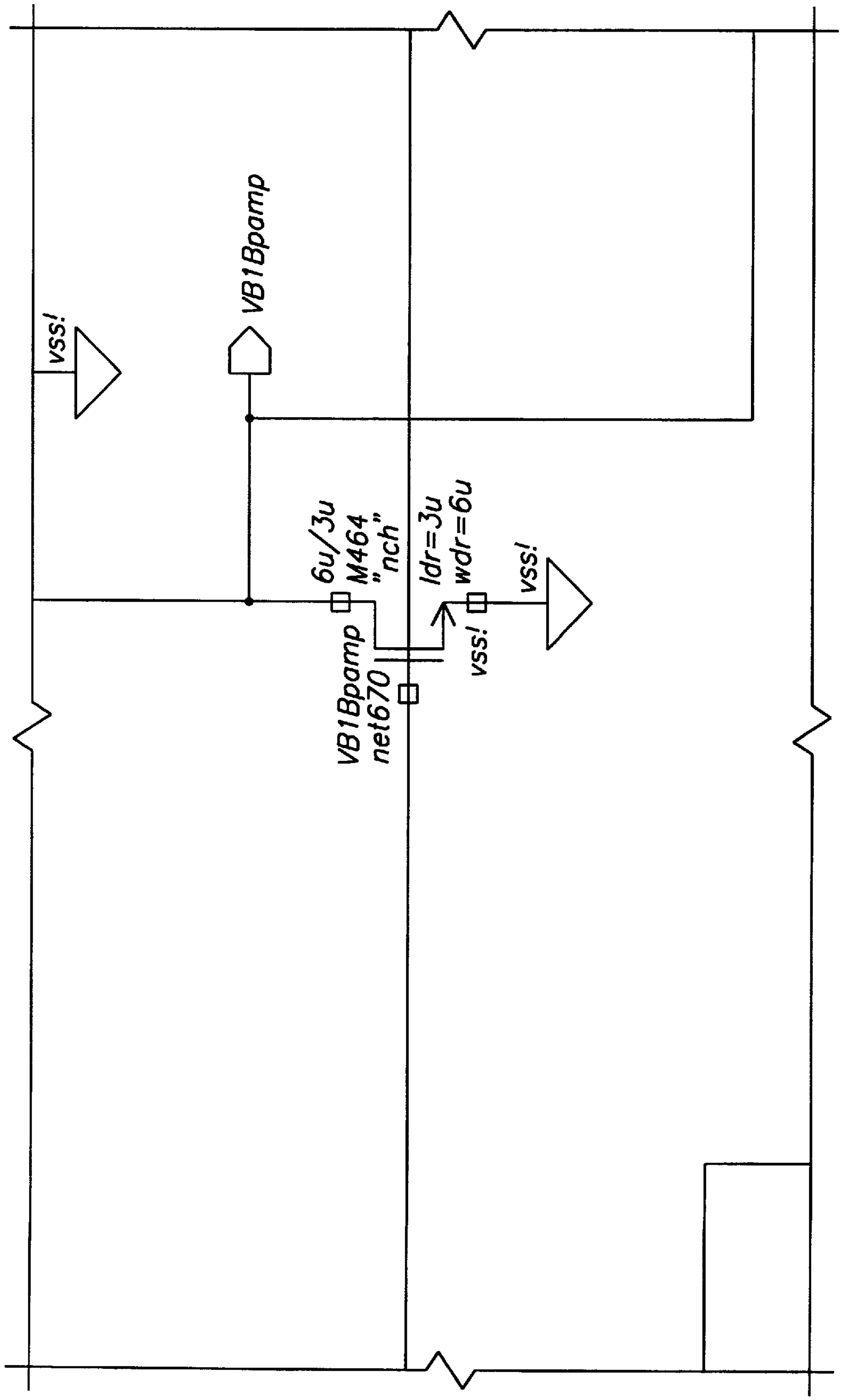
FIG. 8.0607FF

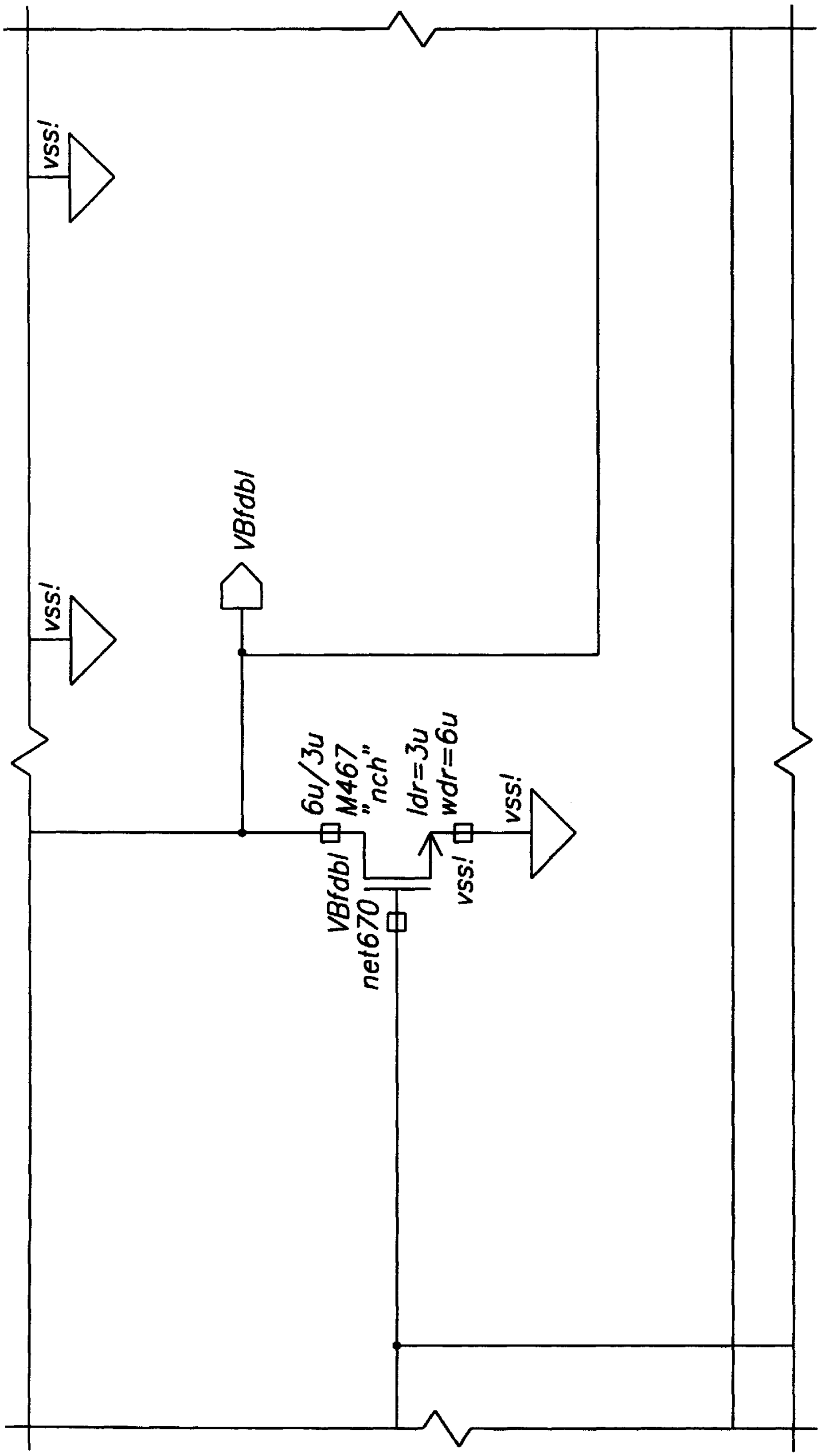
FIG. 8.06O7FG

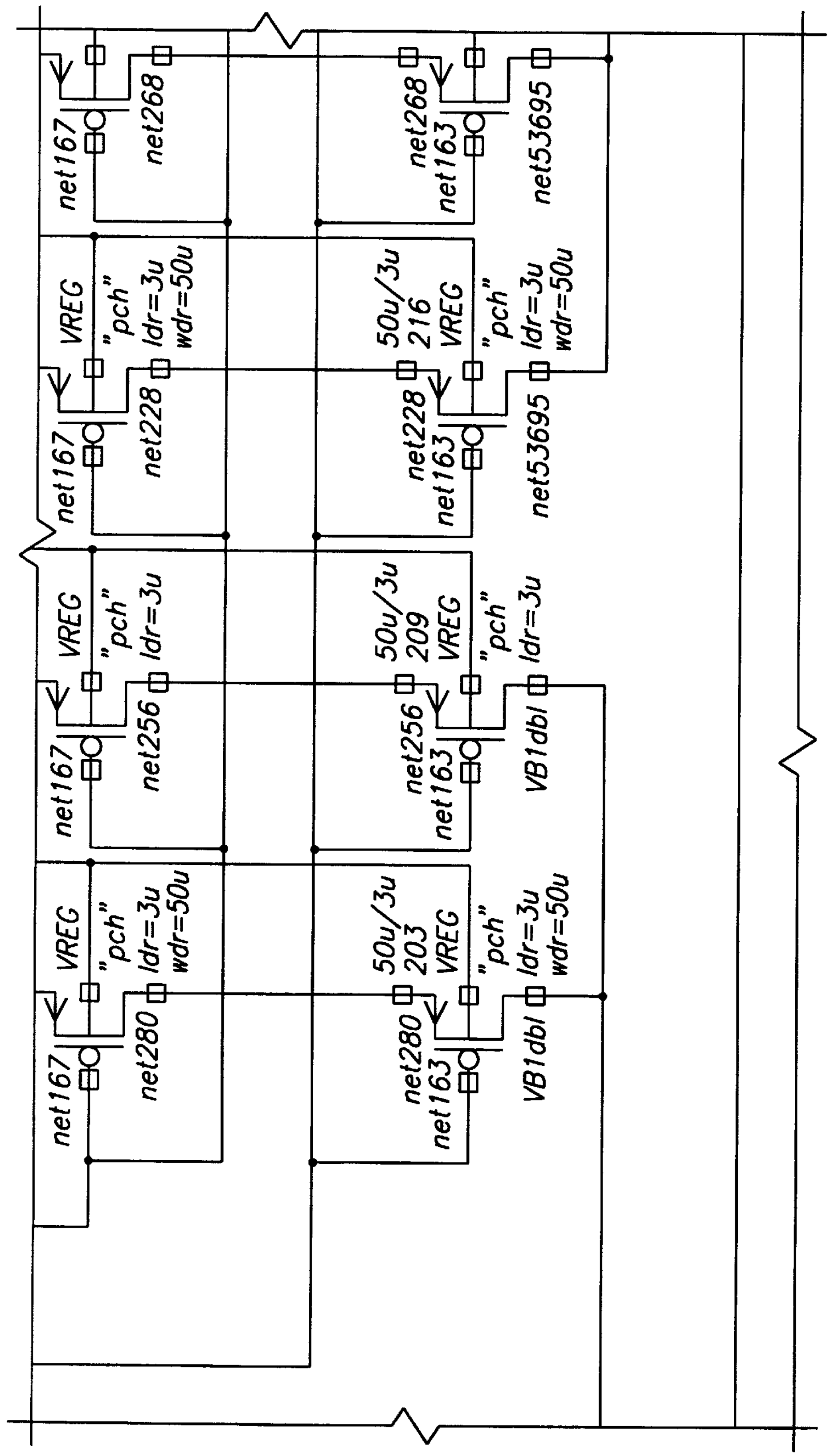
FIG. 8.0607H

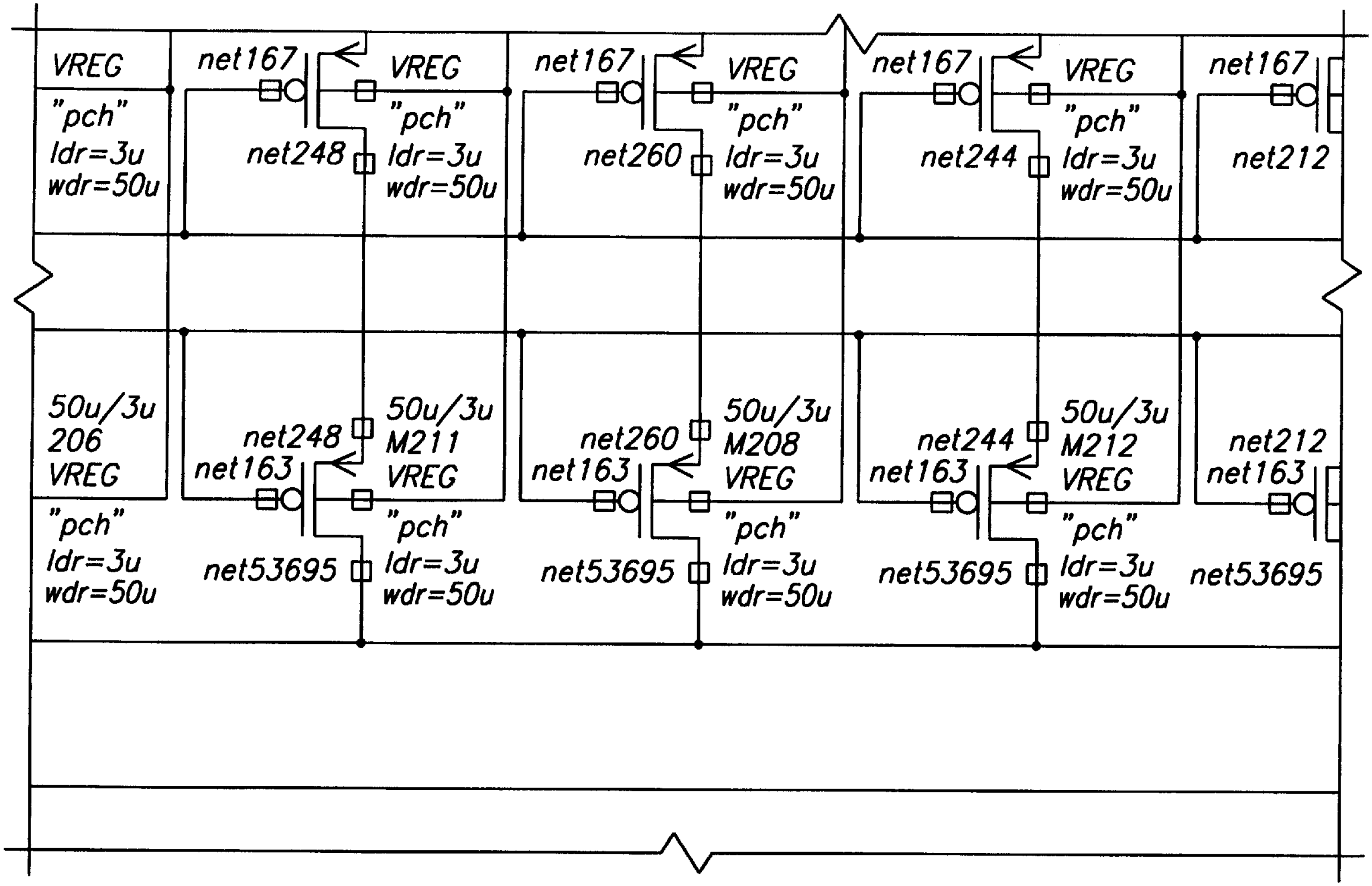
Fig. 8.0607FI

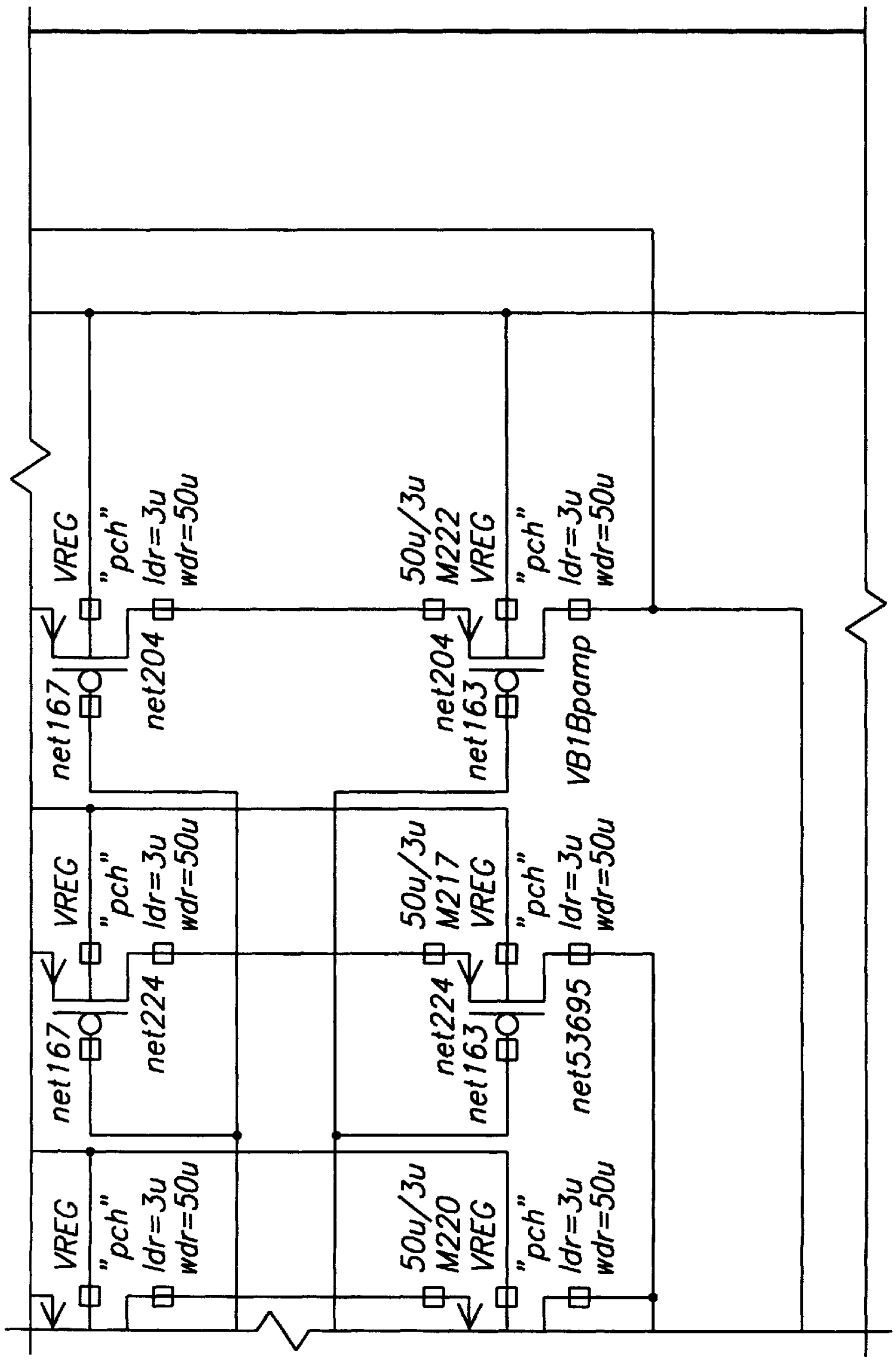
VREG
"pch"
ldr=3u
wdr=50u
net167
net204
50u/3u
M222
net163
VB1Bpamp
M217
net224
net53695
50u/3u
M220

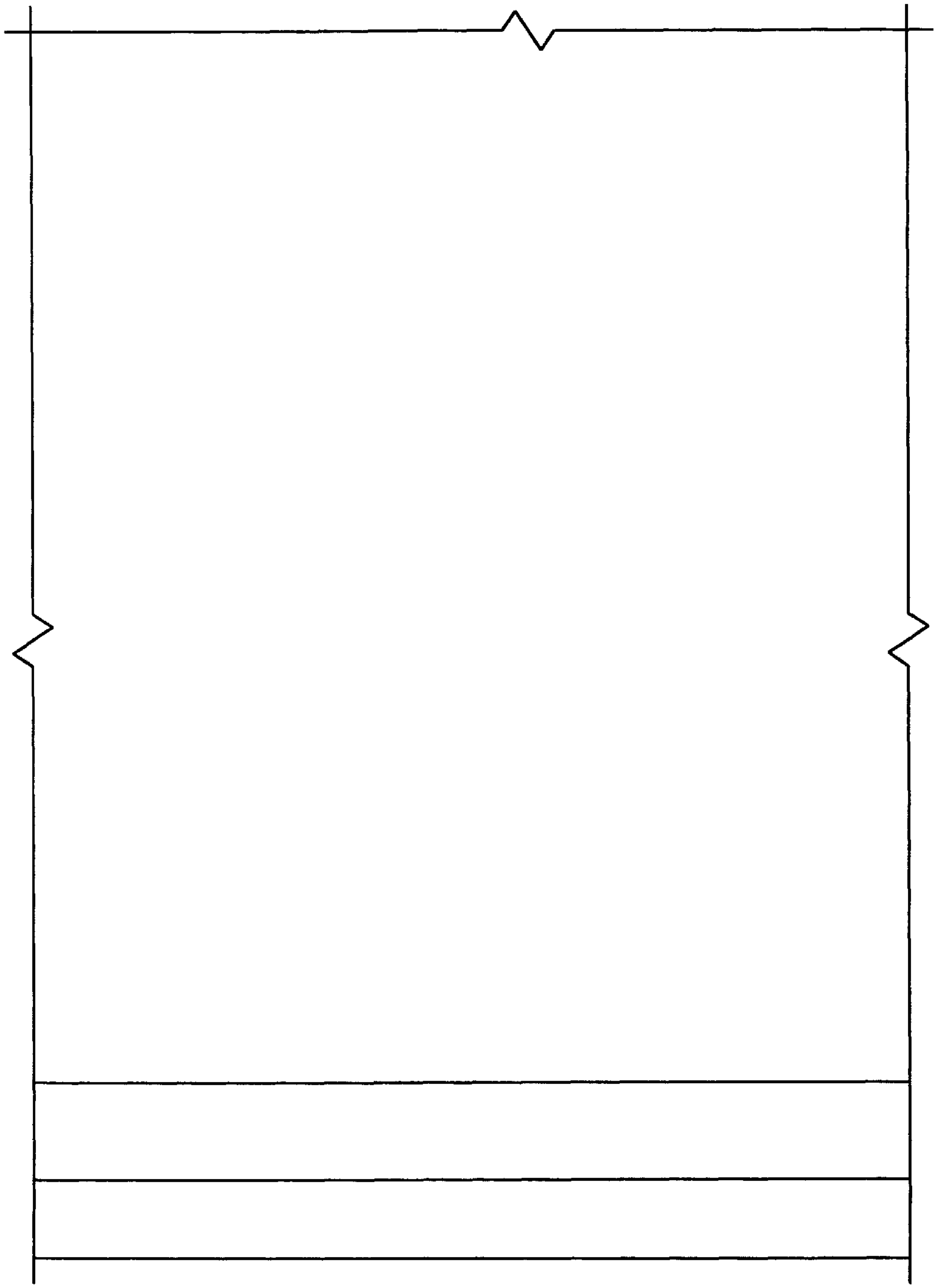
Fig. 8.0607GA

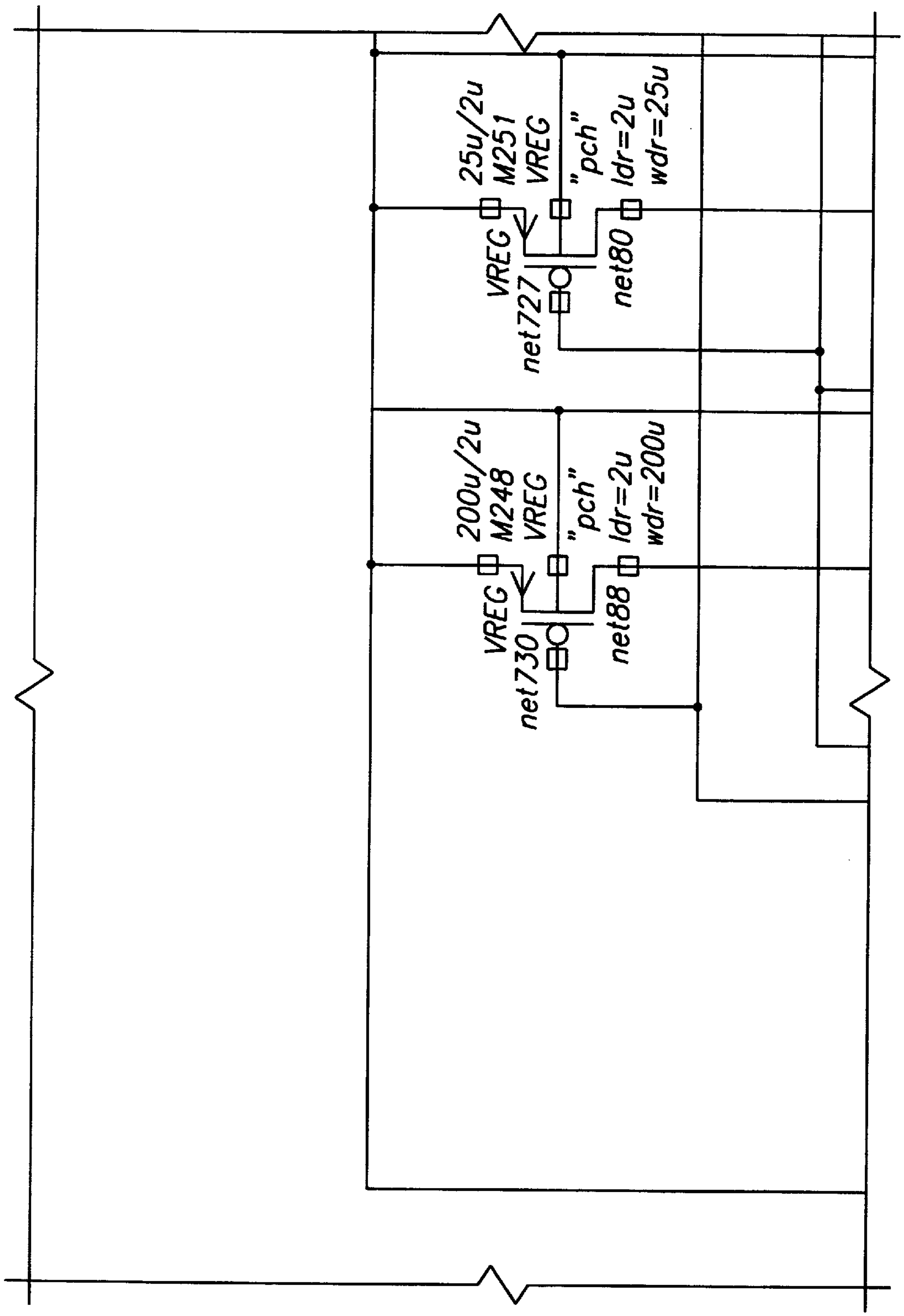
Fig 8.0607GB

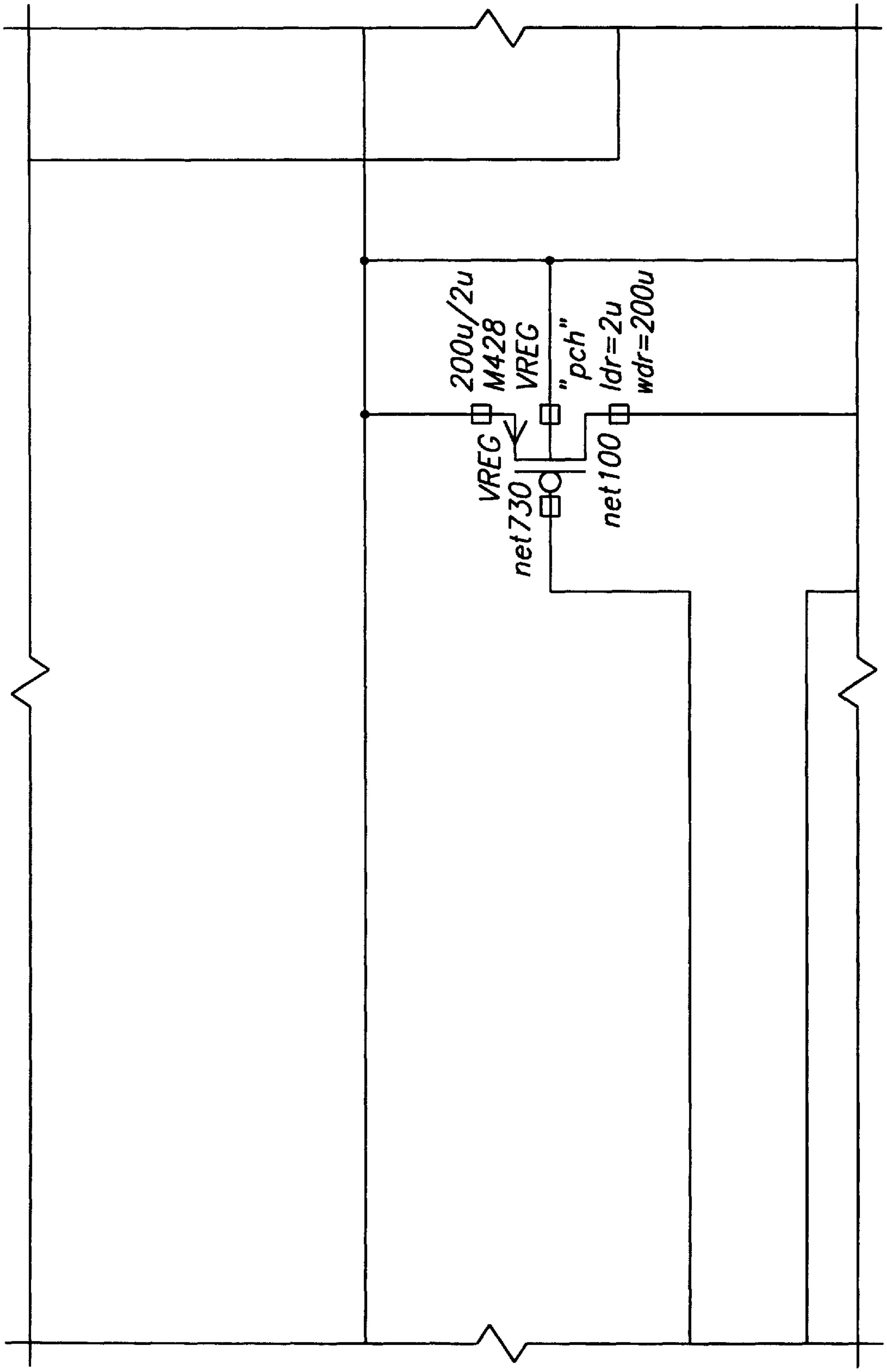
FIG. 8.0607GC

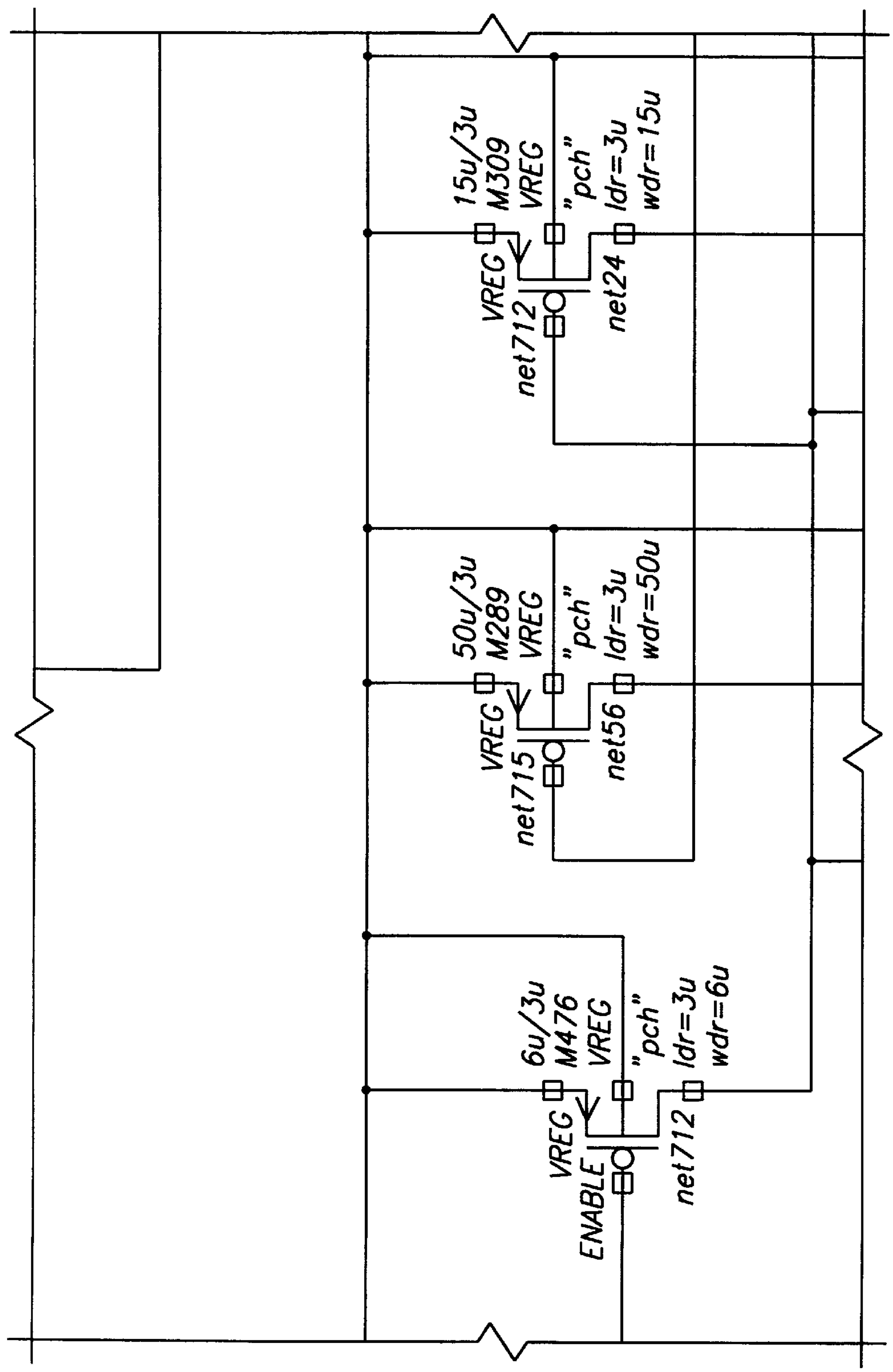
Fig. 8.0607GD

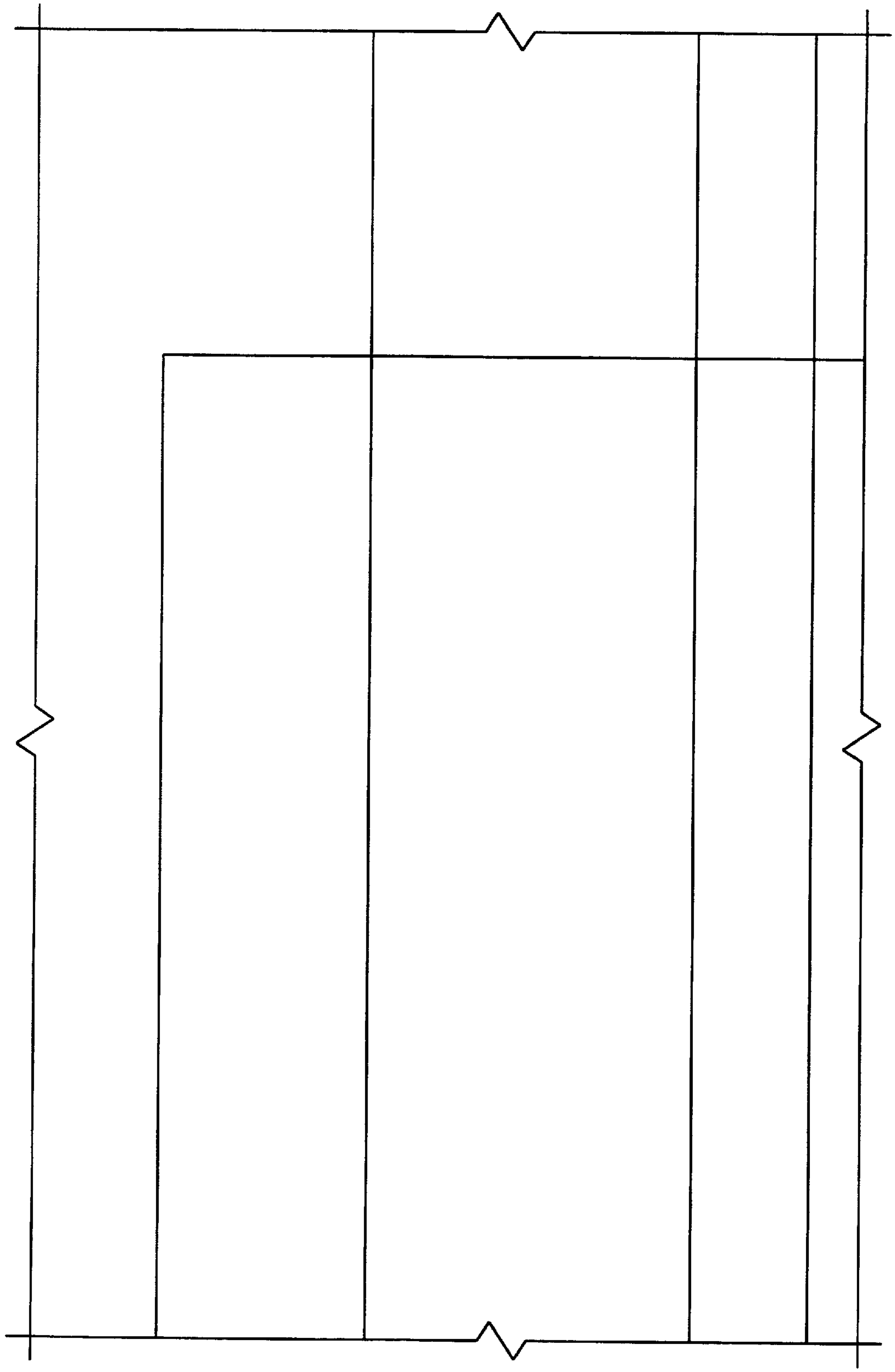
FIG. 8.0607GE

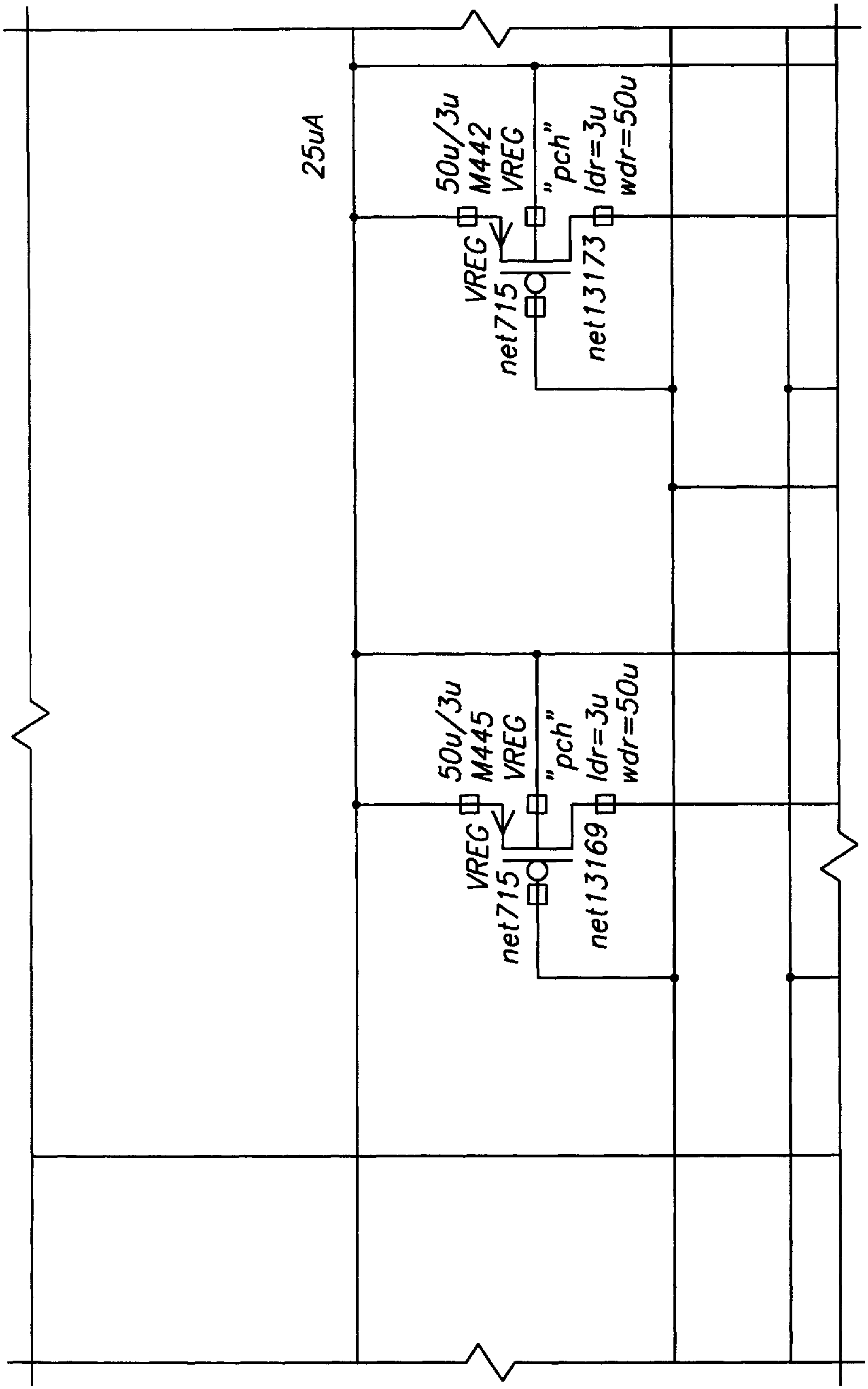
FIG. 8.0607GF

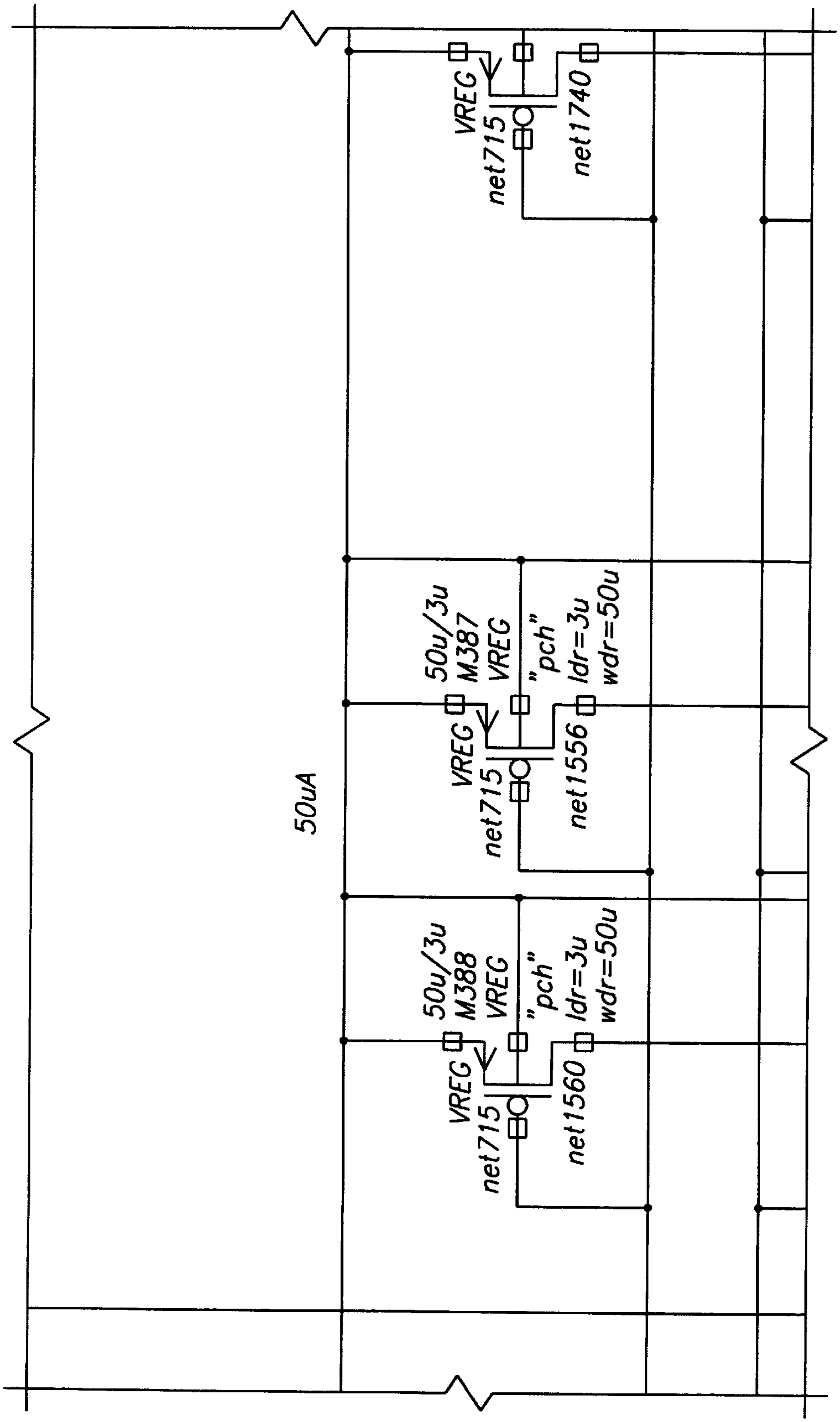
FIG. 8.060.7GG

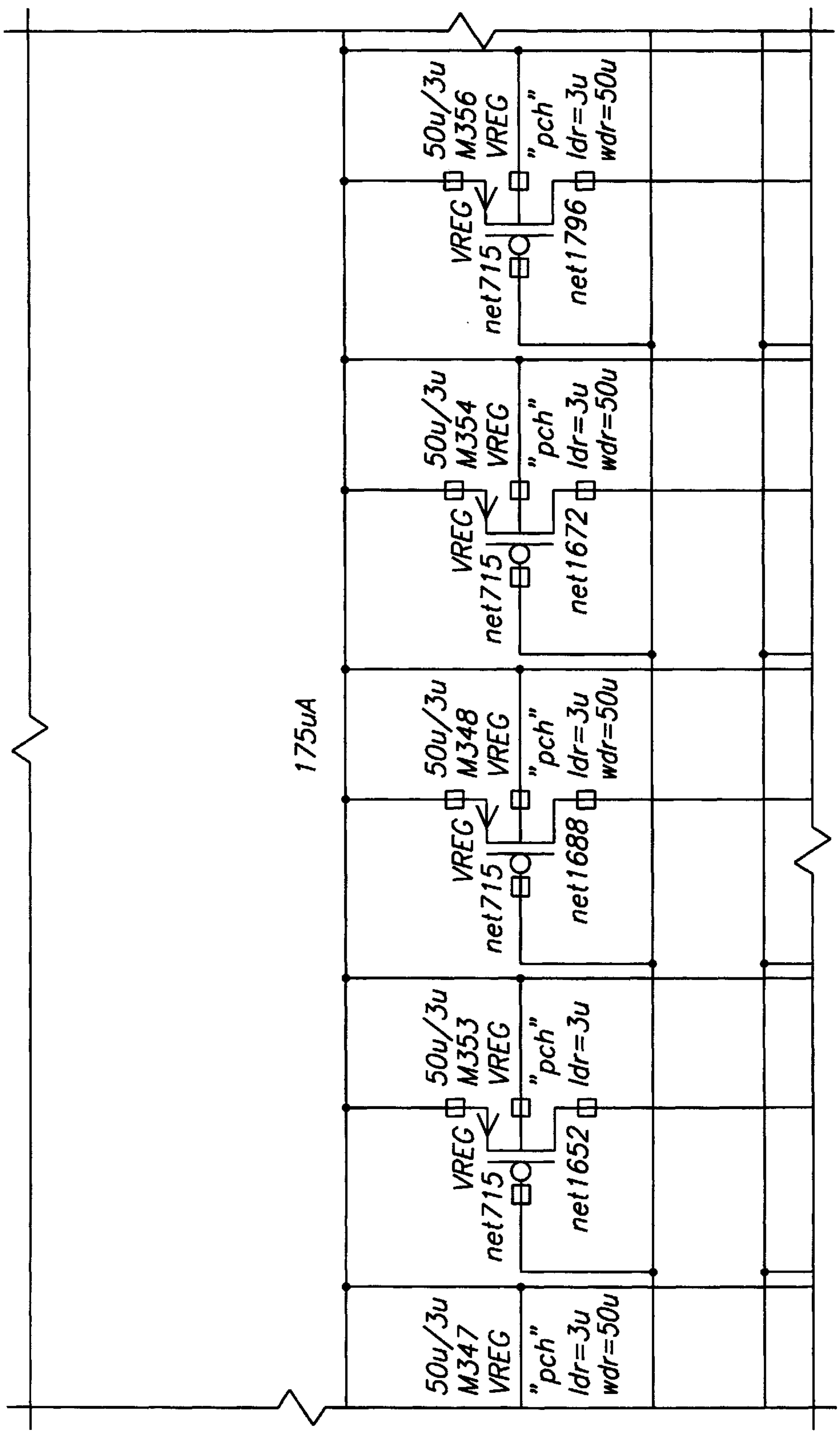
Fig. 8.0607GH

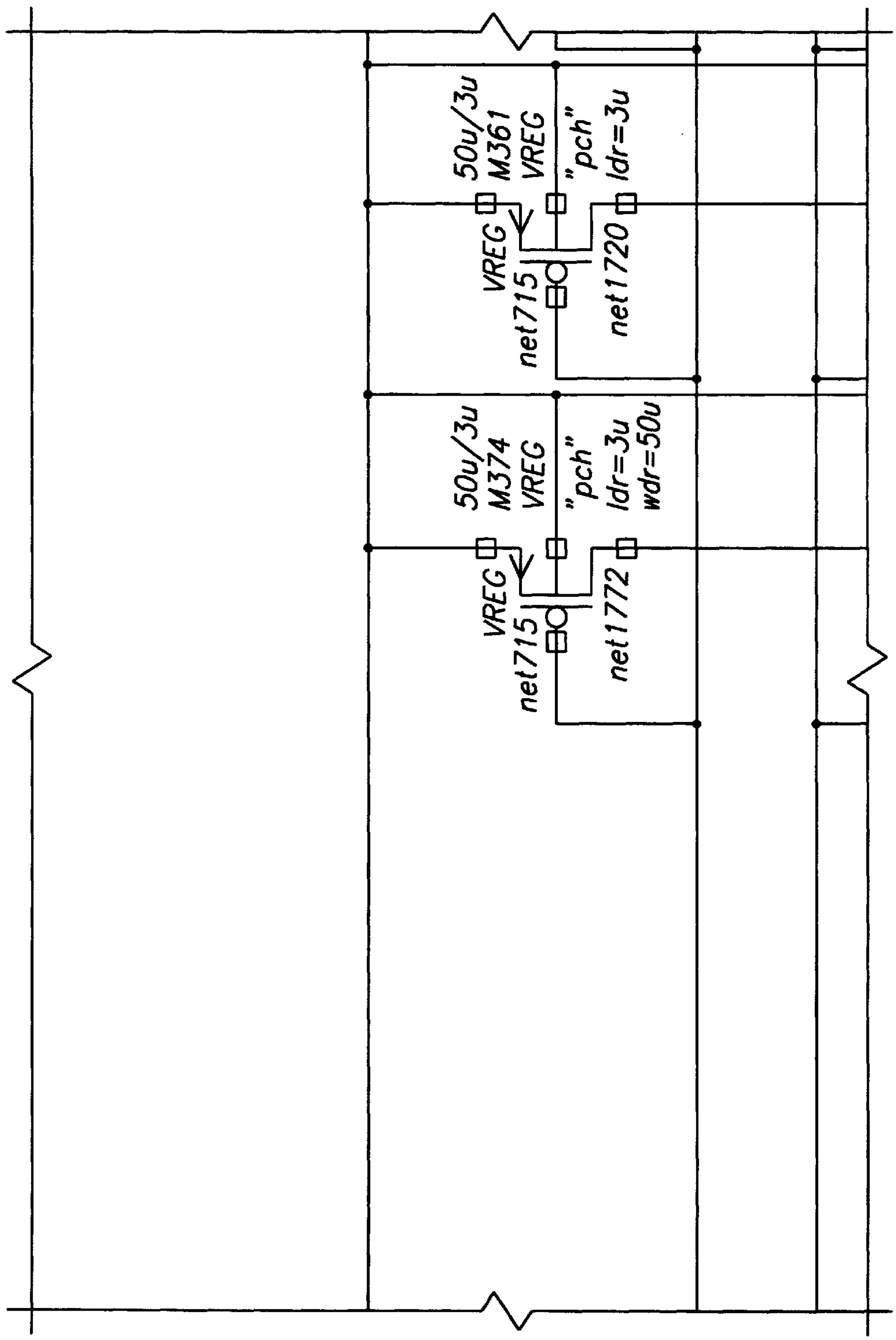
Fig. 8.MM607GI

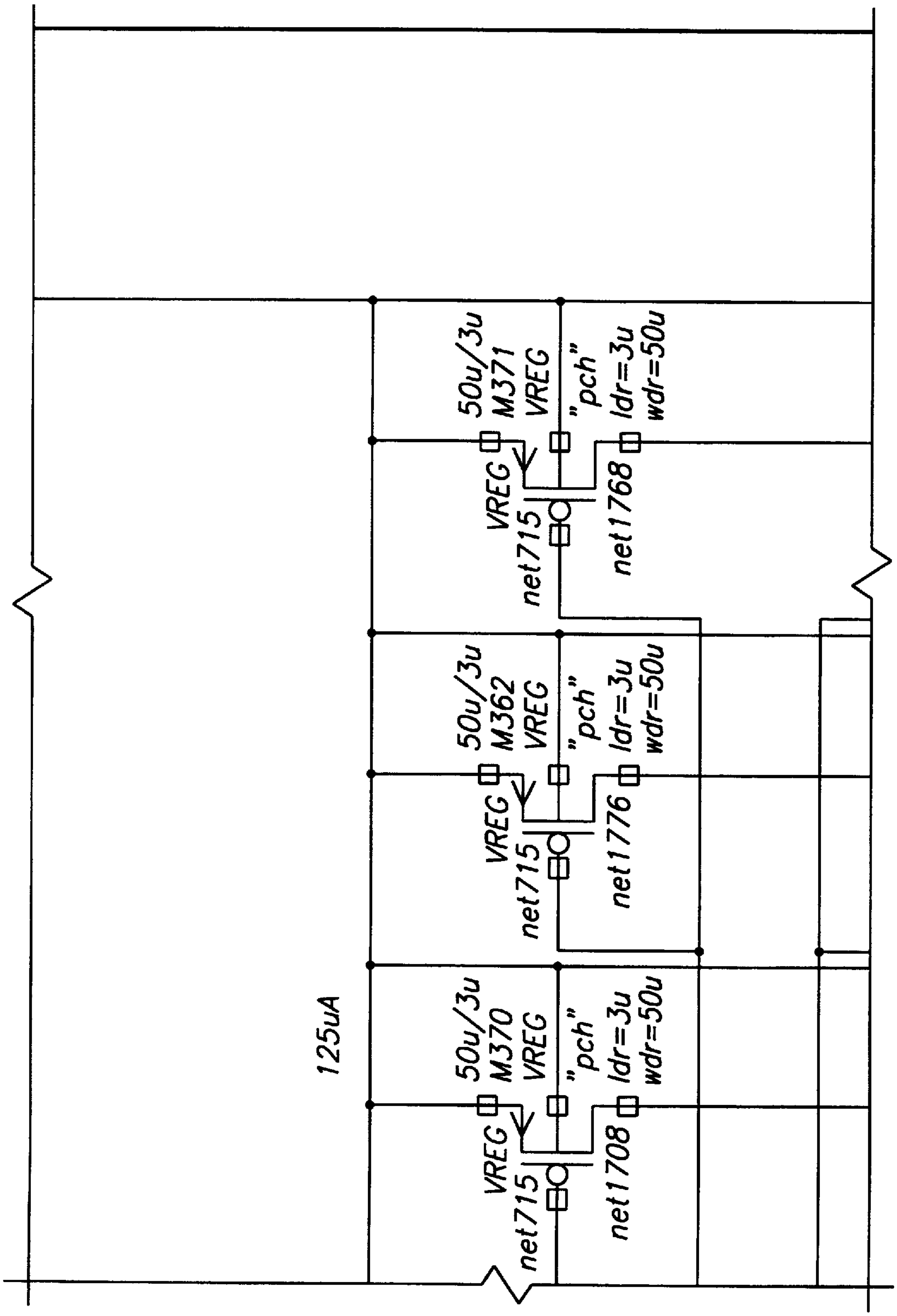
Fig. 8.0607G

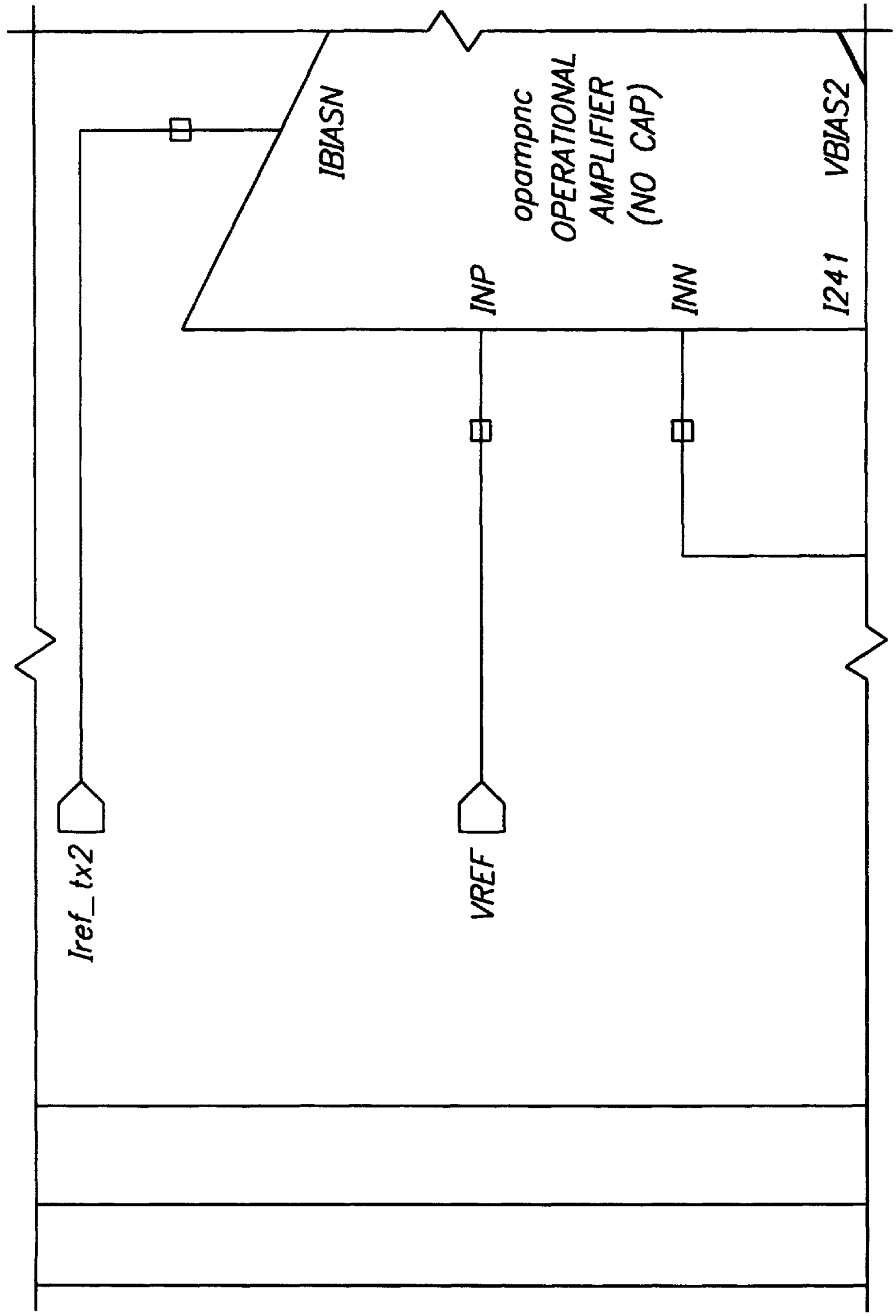
FIG. 8.0607HA

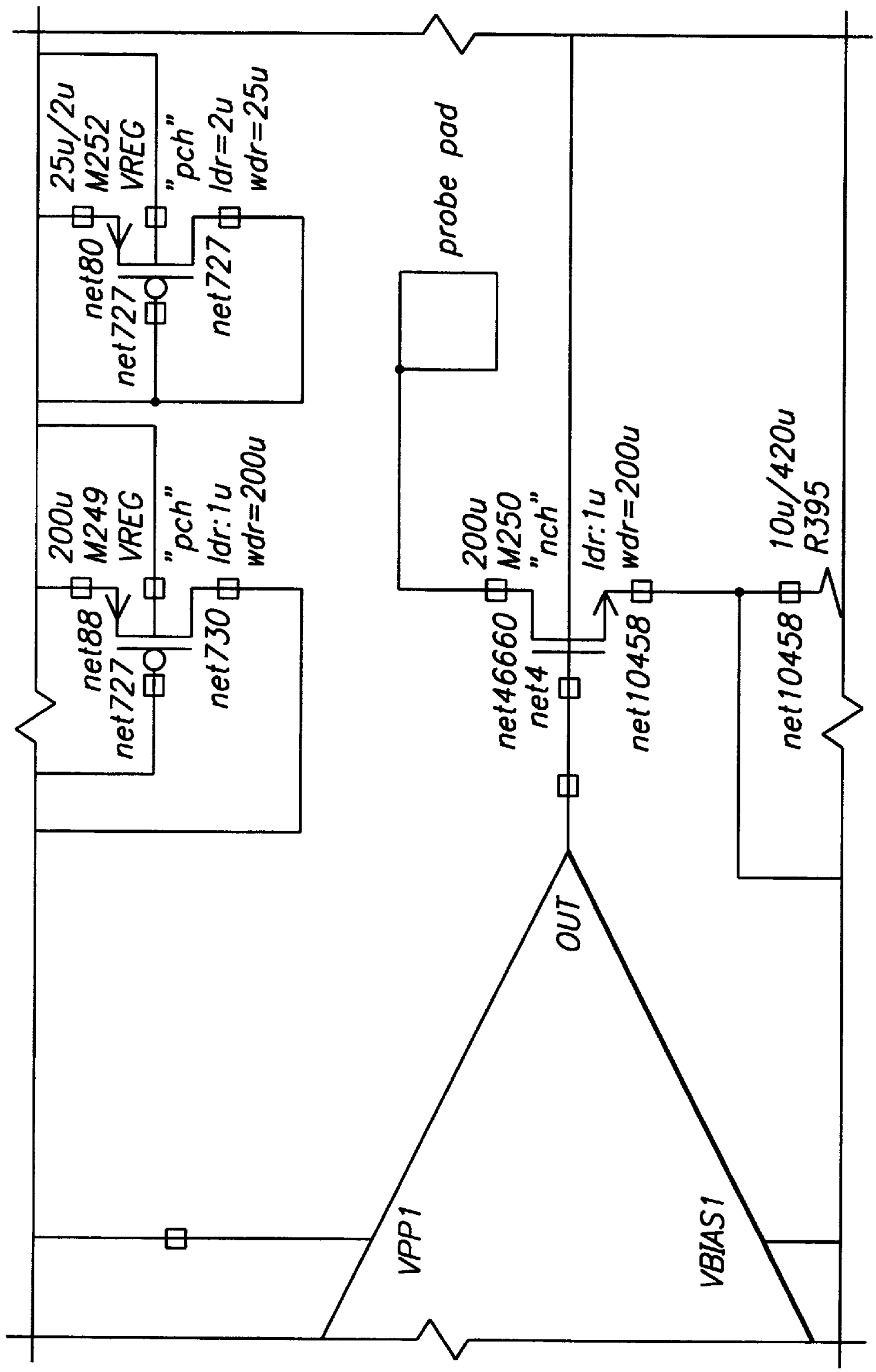
Fig. 8.060.7HB

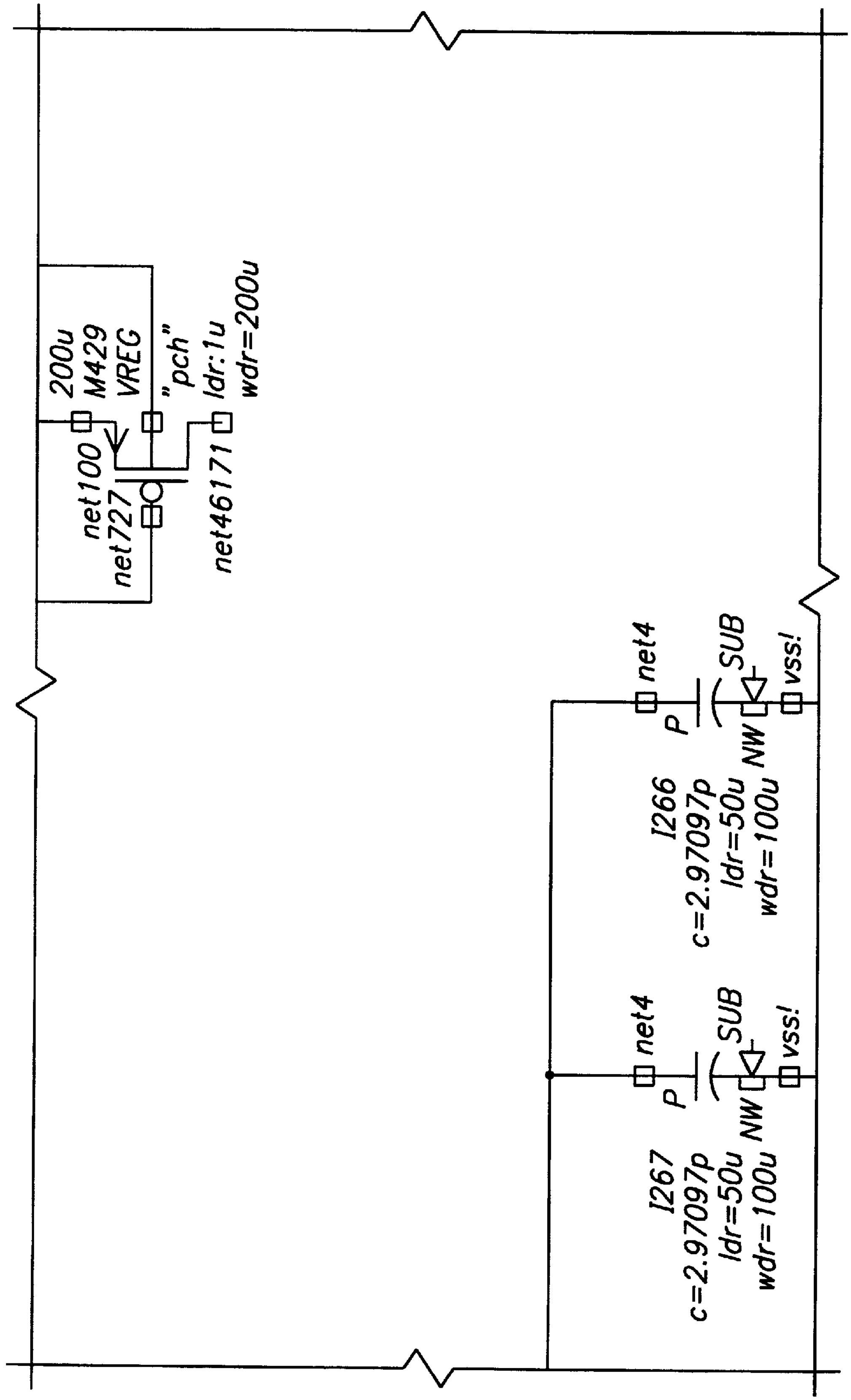
200u
M429
VREG
"pch"
ldr:1u
wdr=200u
net100
net727
net46171
net4
SUB
vss!
P
NW
I266
c=2.97097p
ldr=50u
wdr=100u
net4
SUB
vss!
P
NW
I267
c=2.97097p
ldr=50u
wdr=100u

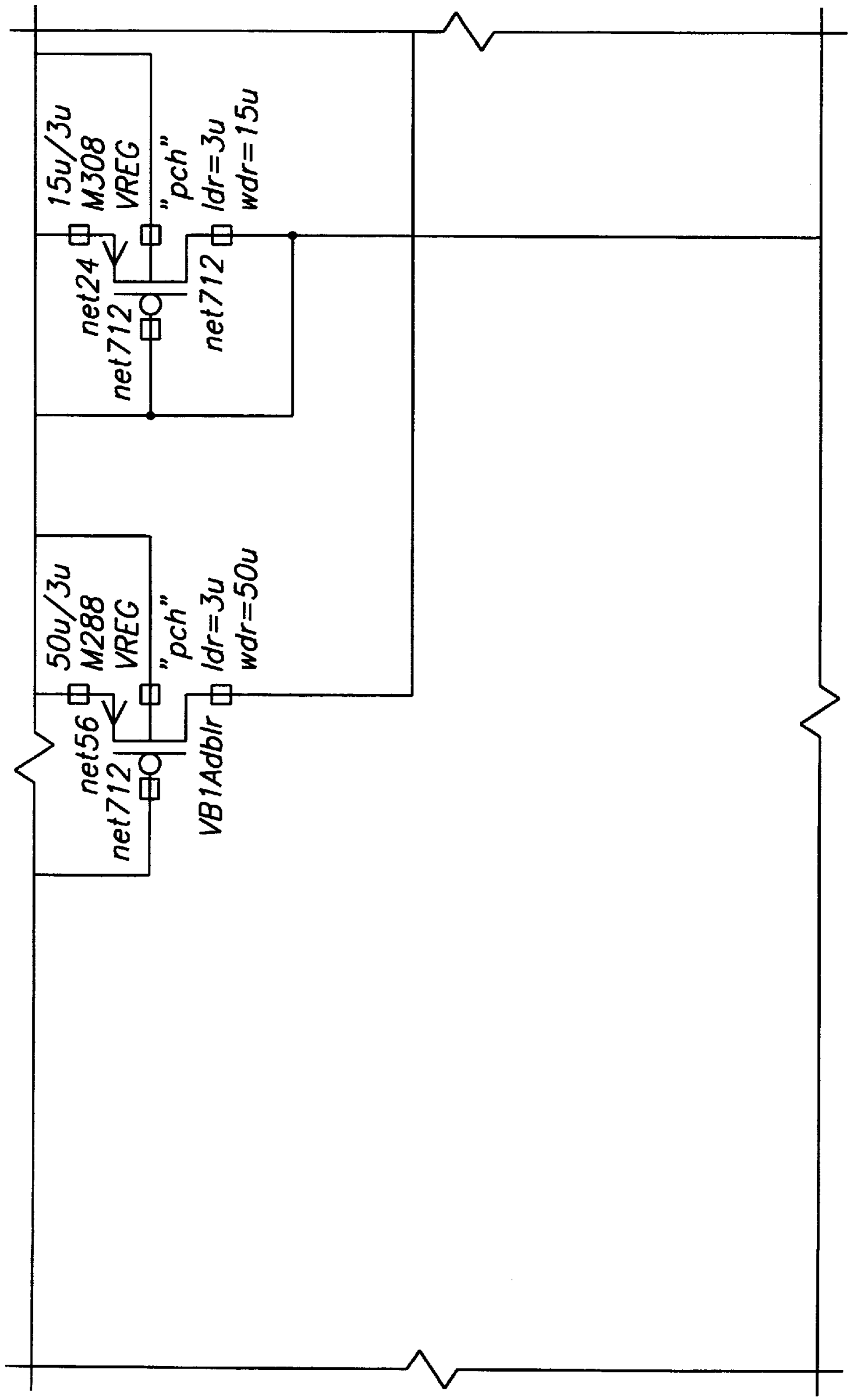
FIG. 8.0607HD

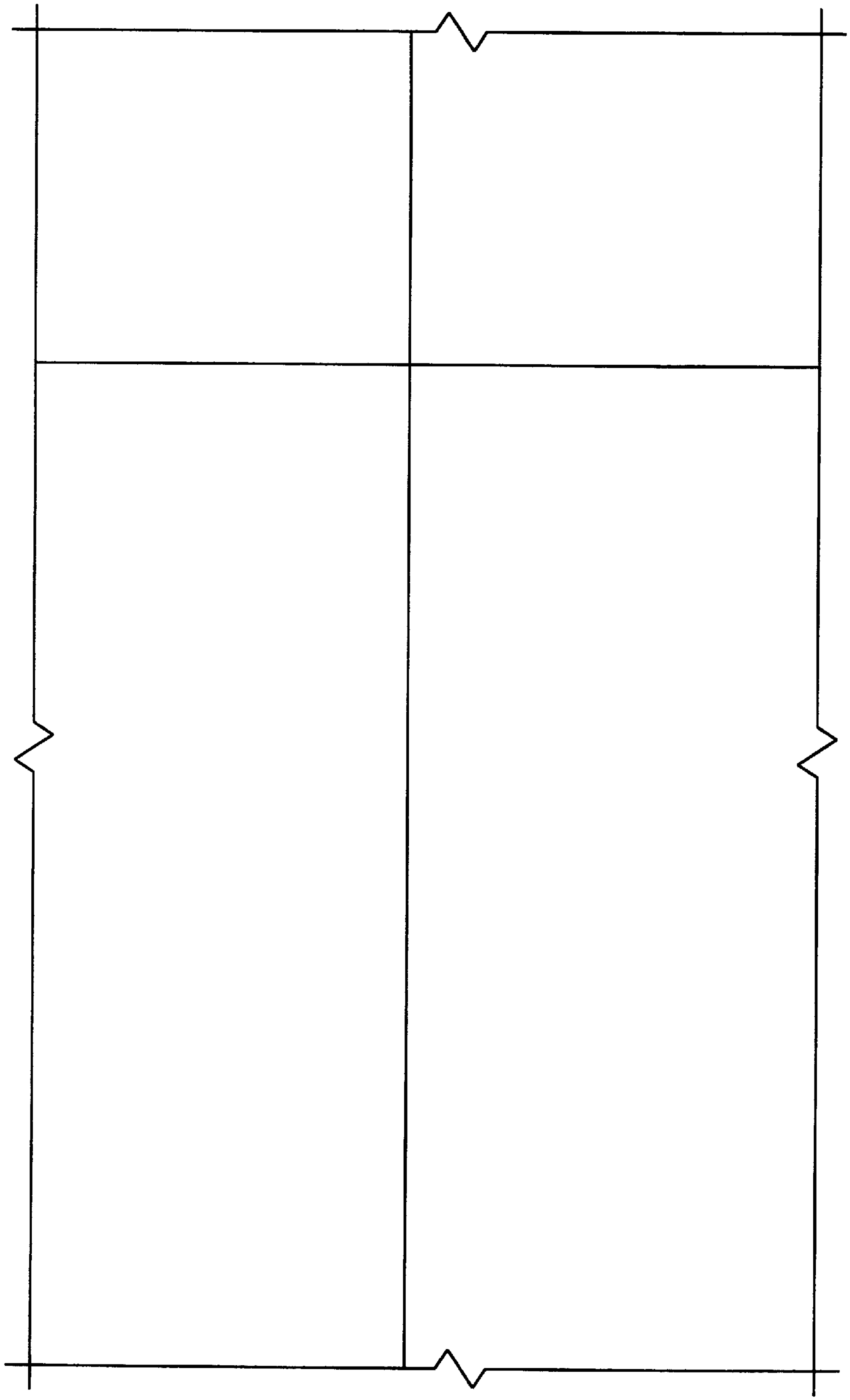
Fig 8.0607AE

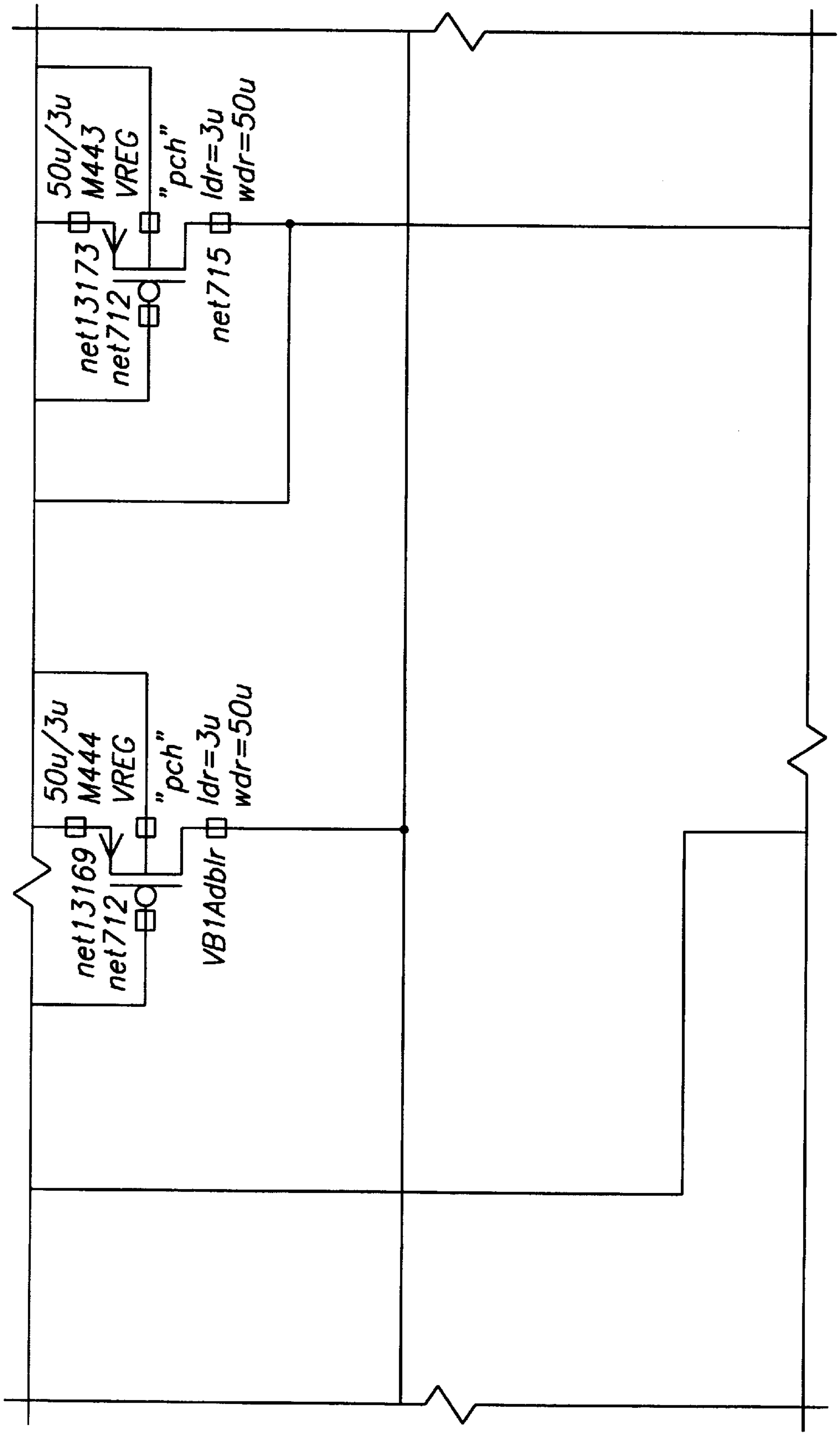
Fig. 8.060.7HF

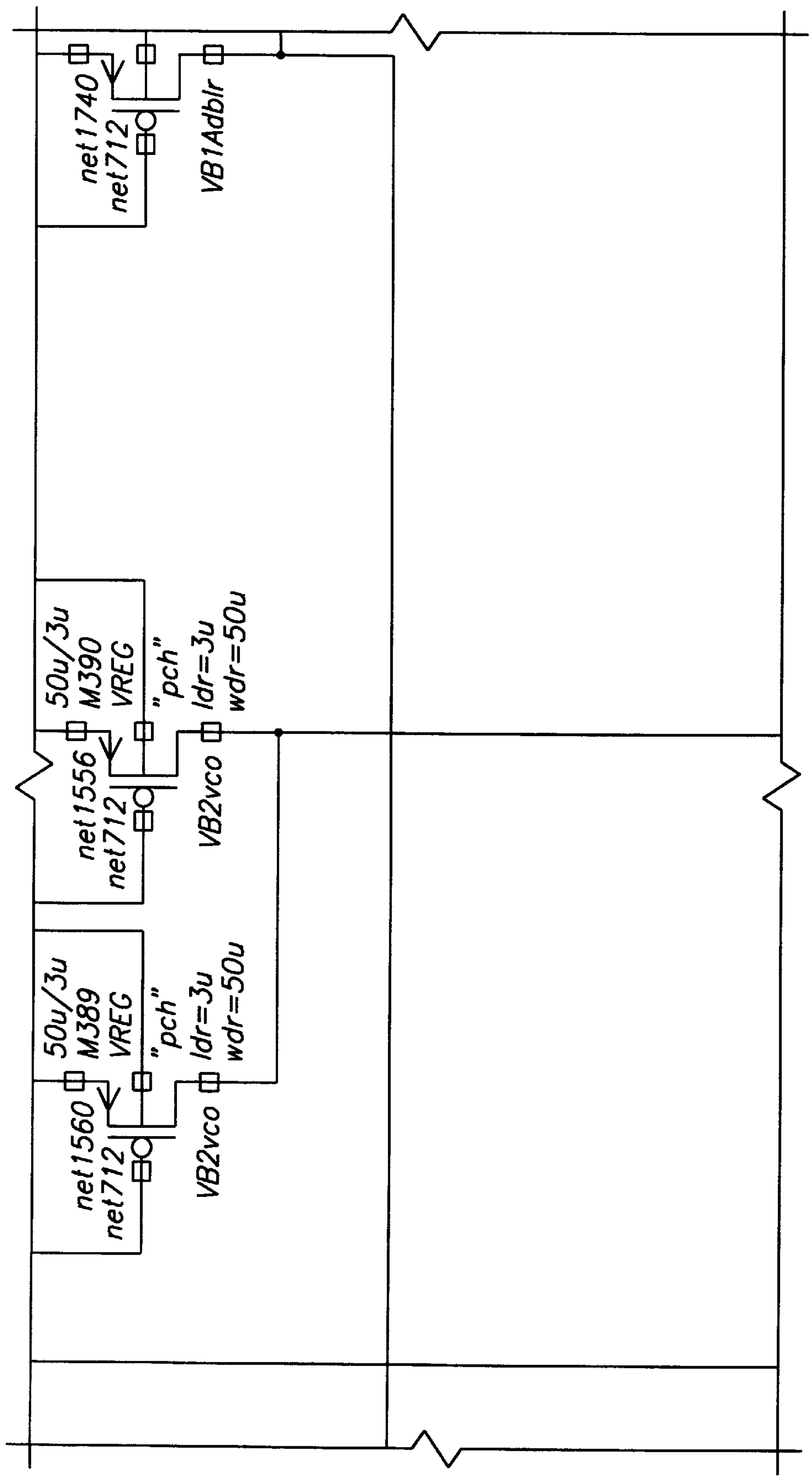
FIG. 8.060ZAG

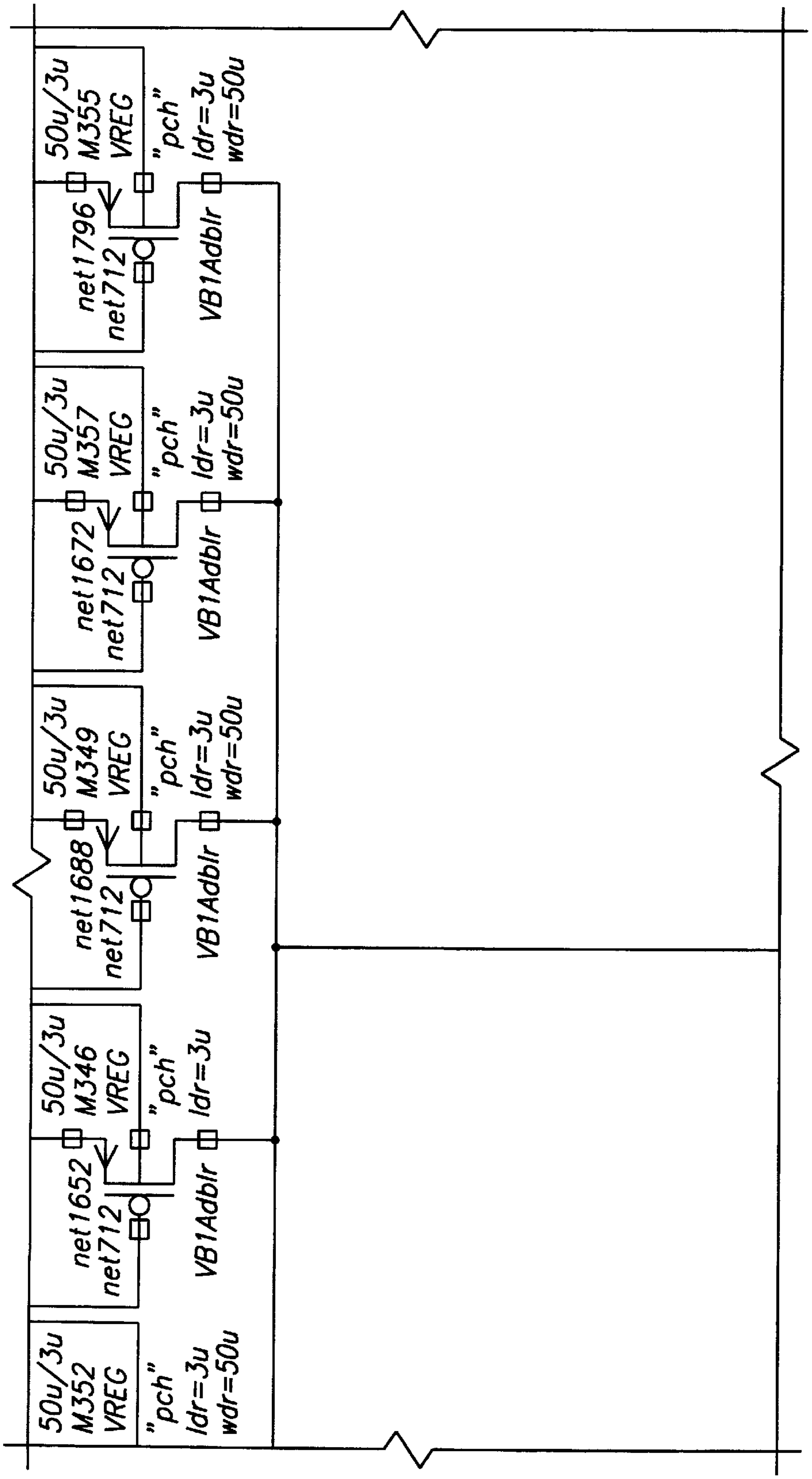
Fig. 8.0607HHH

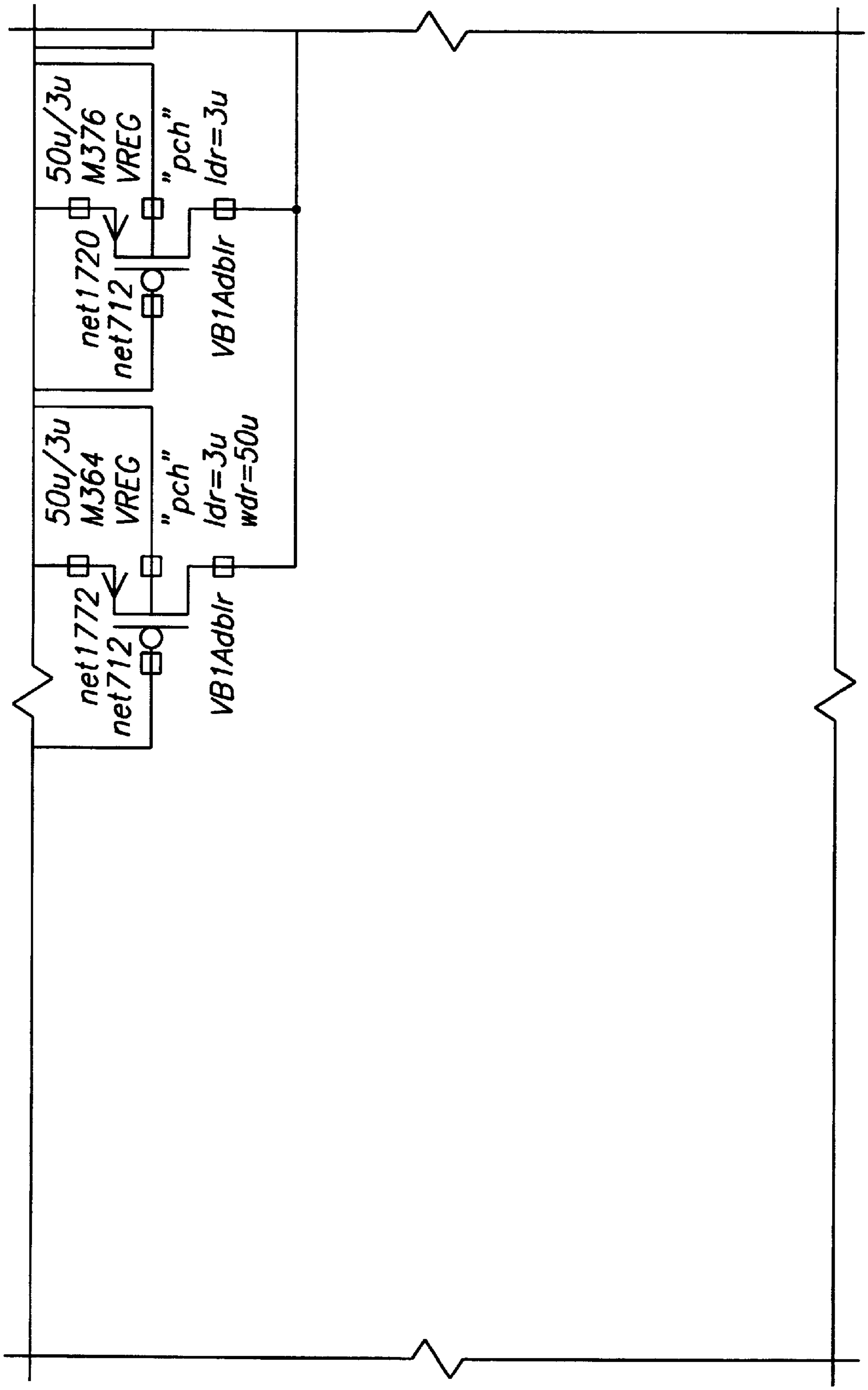
Fig. 8.060AHI

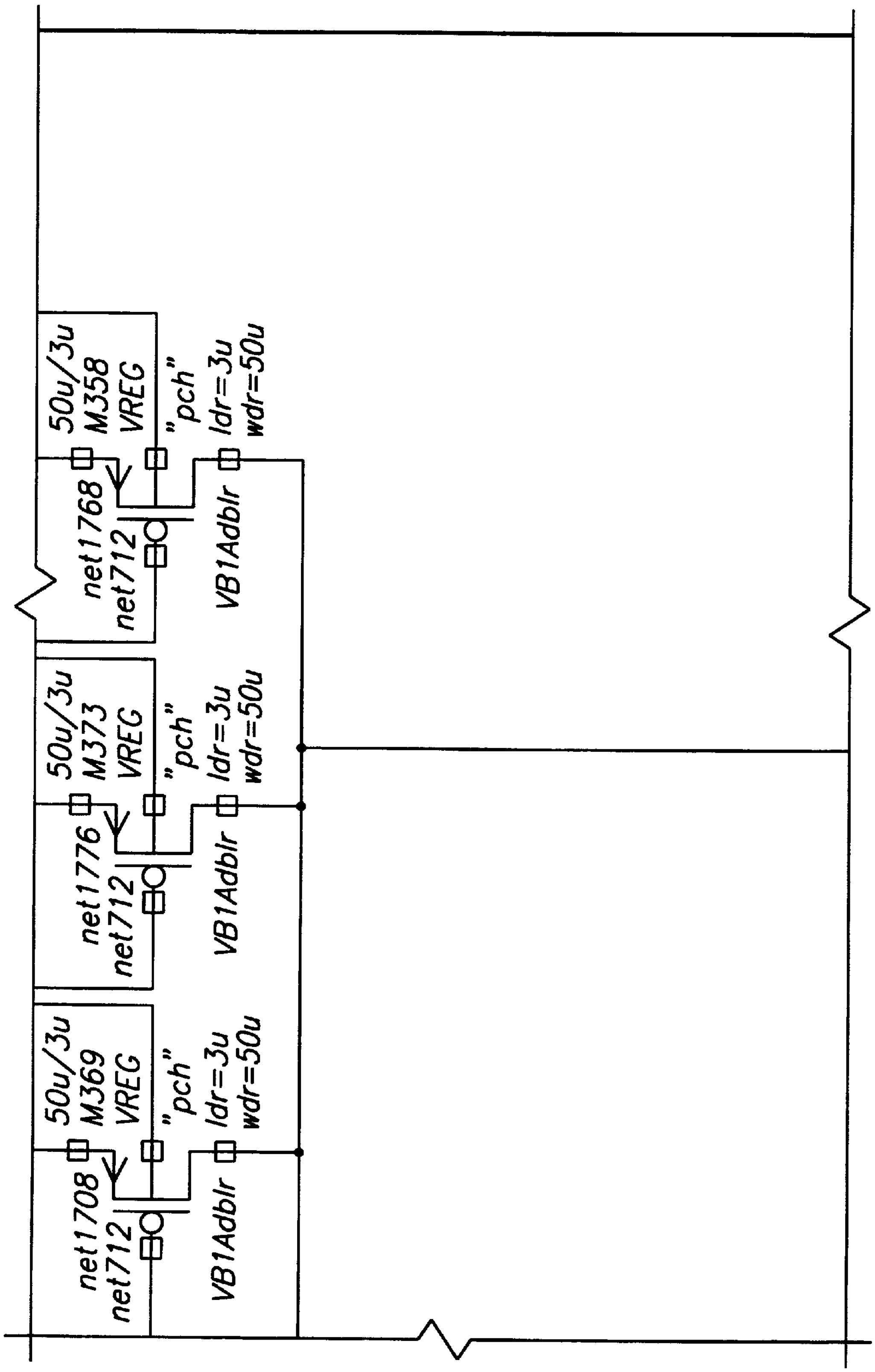
Fig. 8.0607HJ

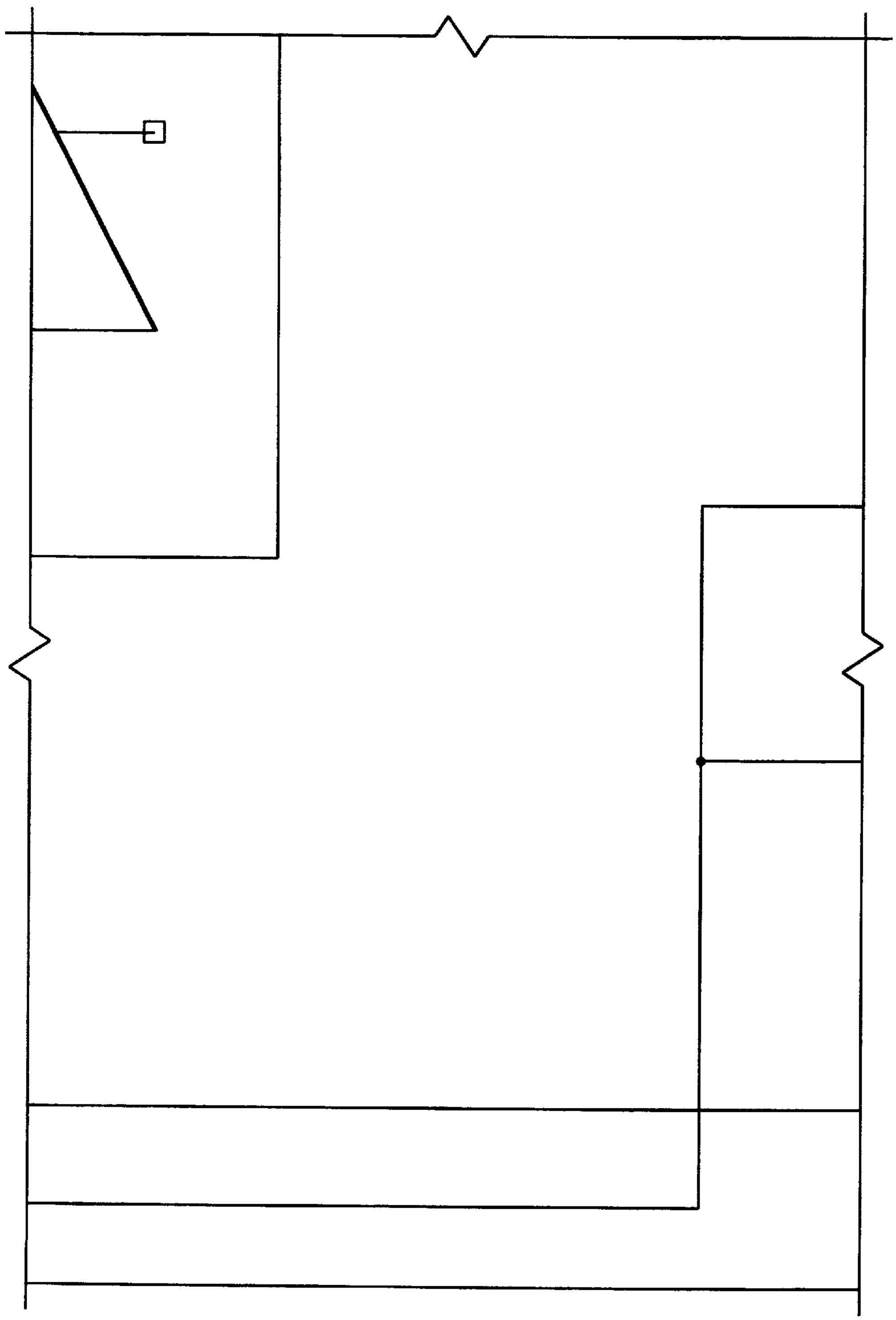
FIG. 8.060711A

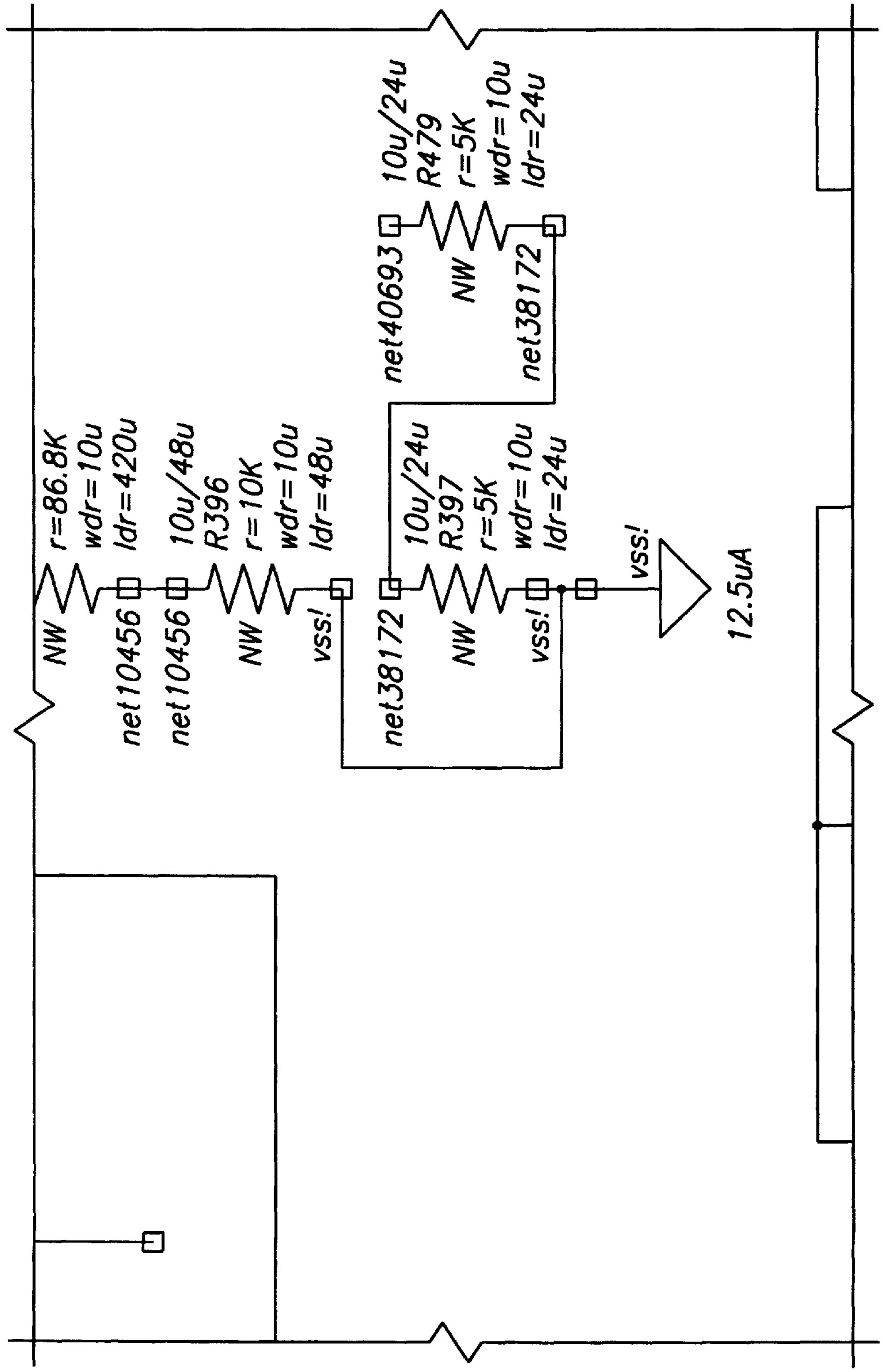
FIG. 8.0607IIB

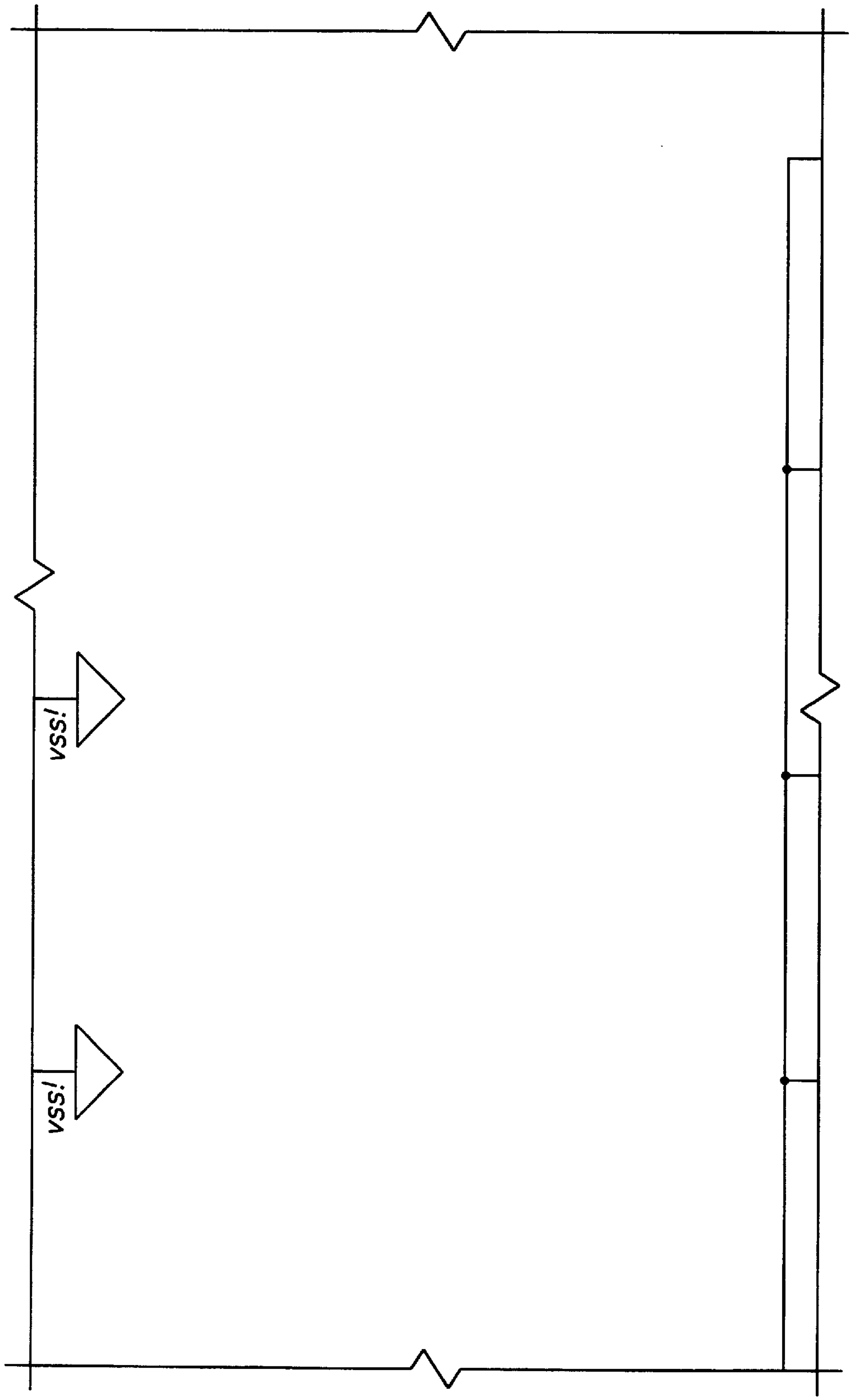
FIG. 8.0607IIC

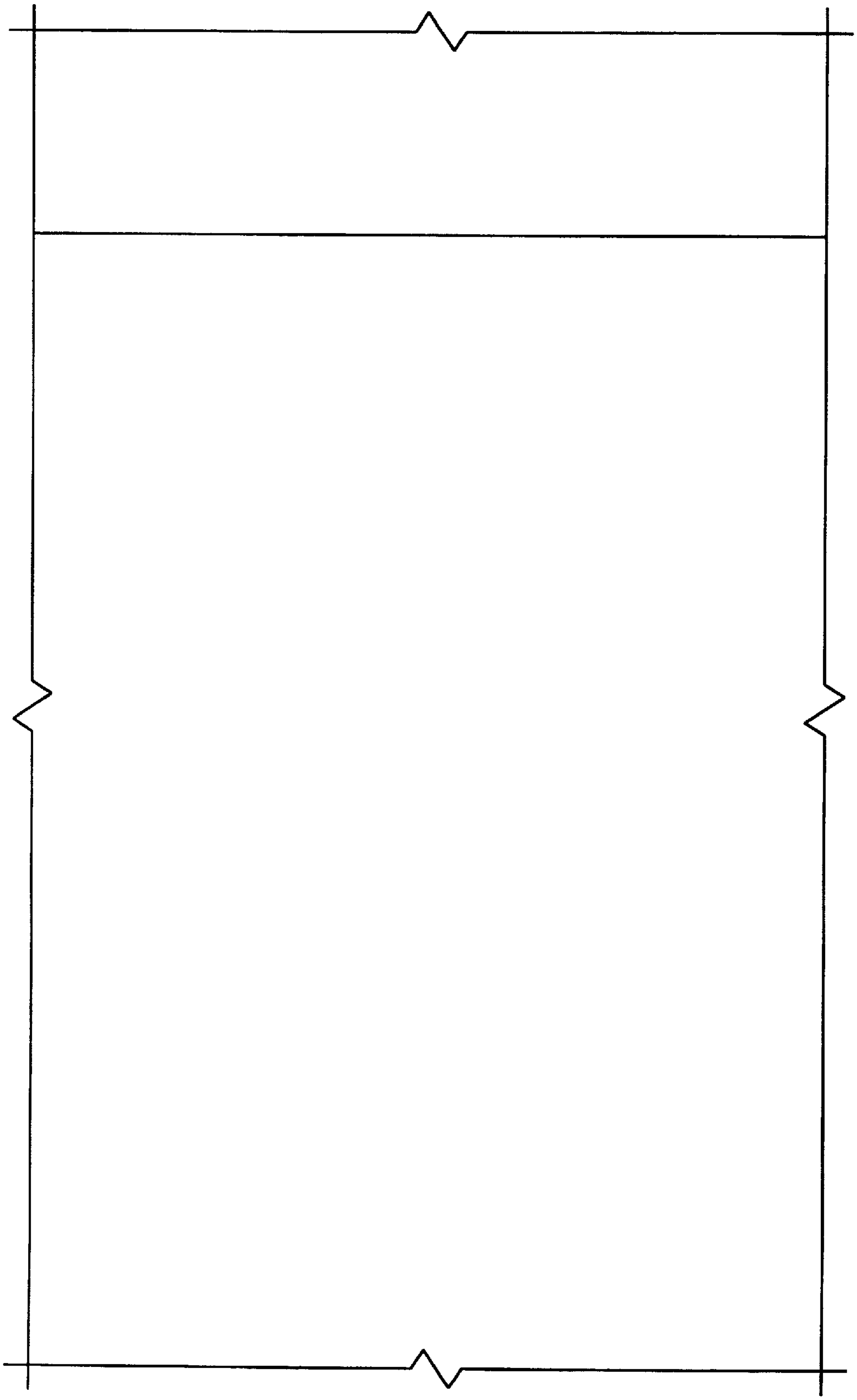
FIG. 8.06071D

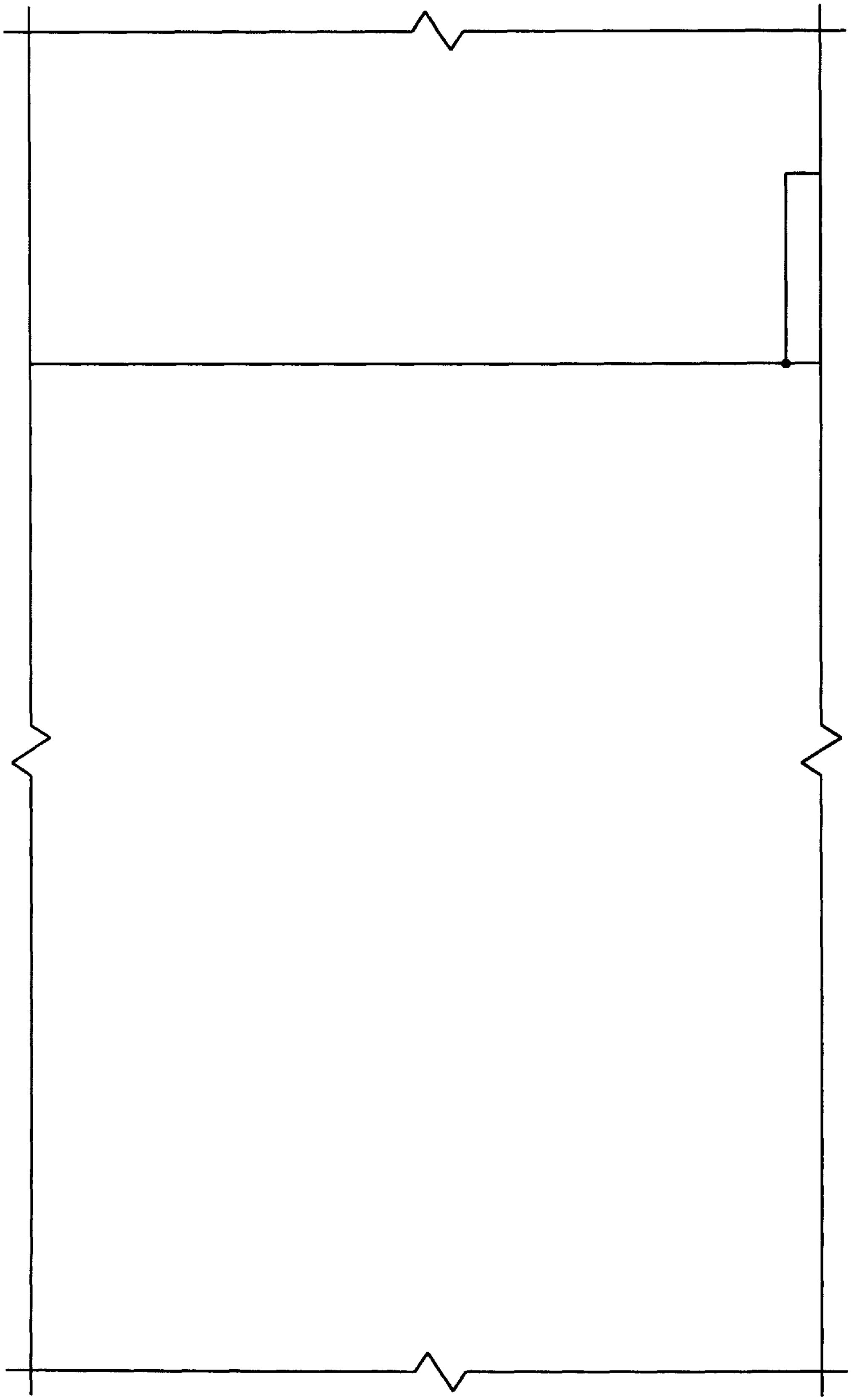
FIG. 8.06071E

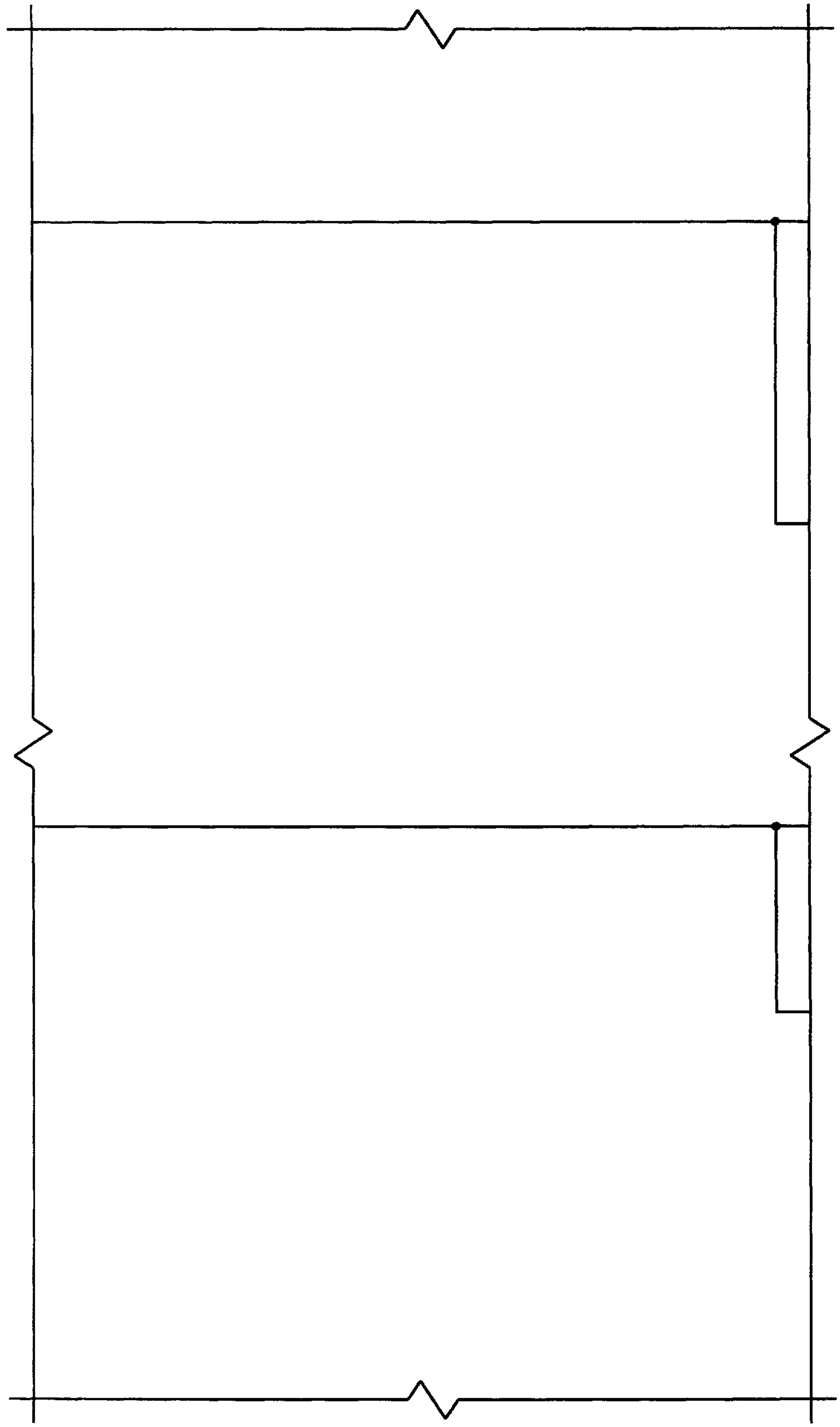
Fig. 8.060JIF

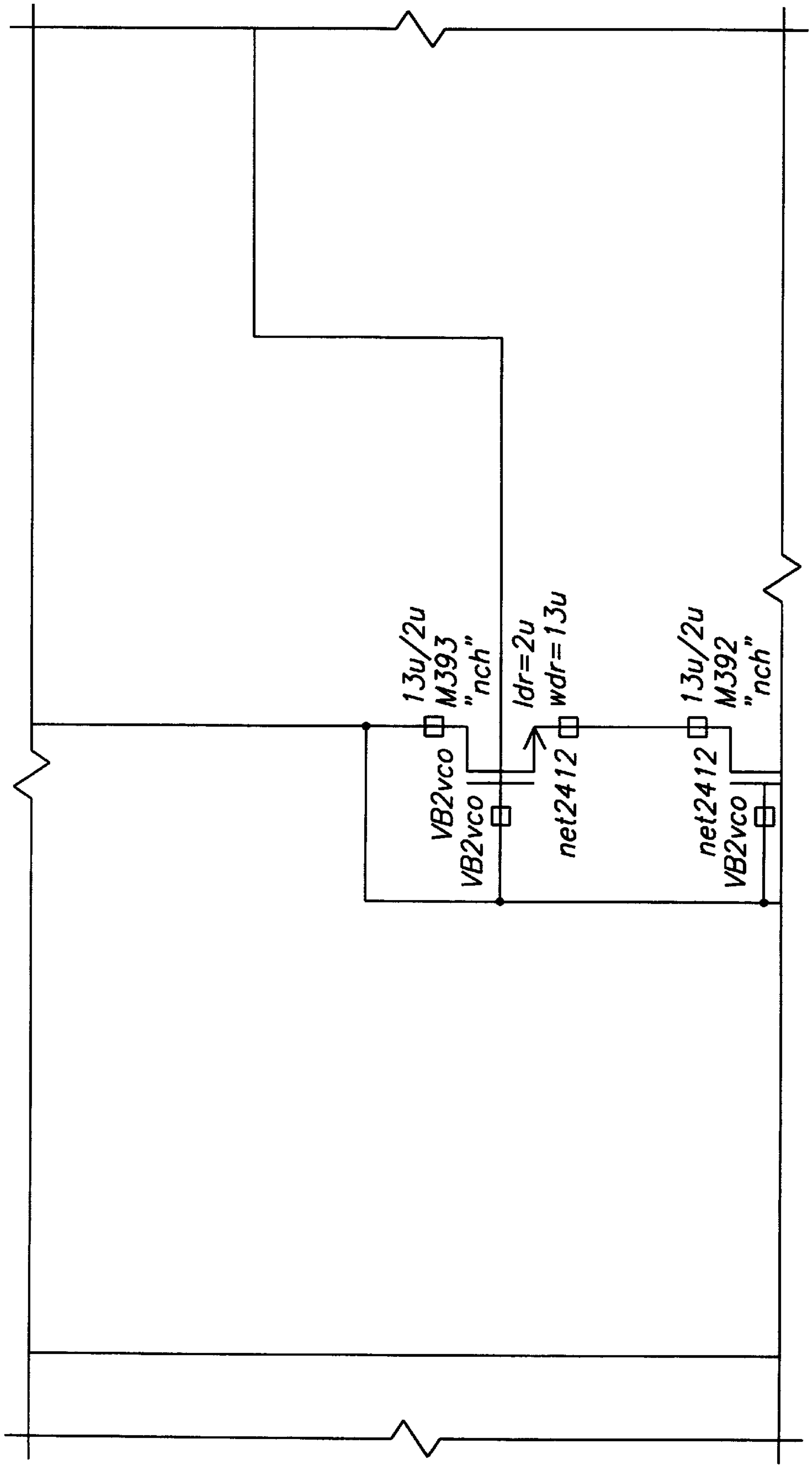
FIG. 8.0607IIG

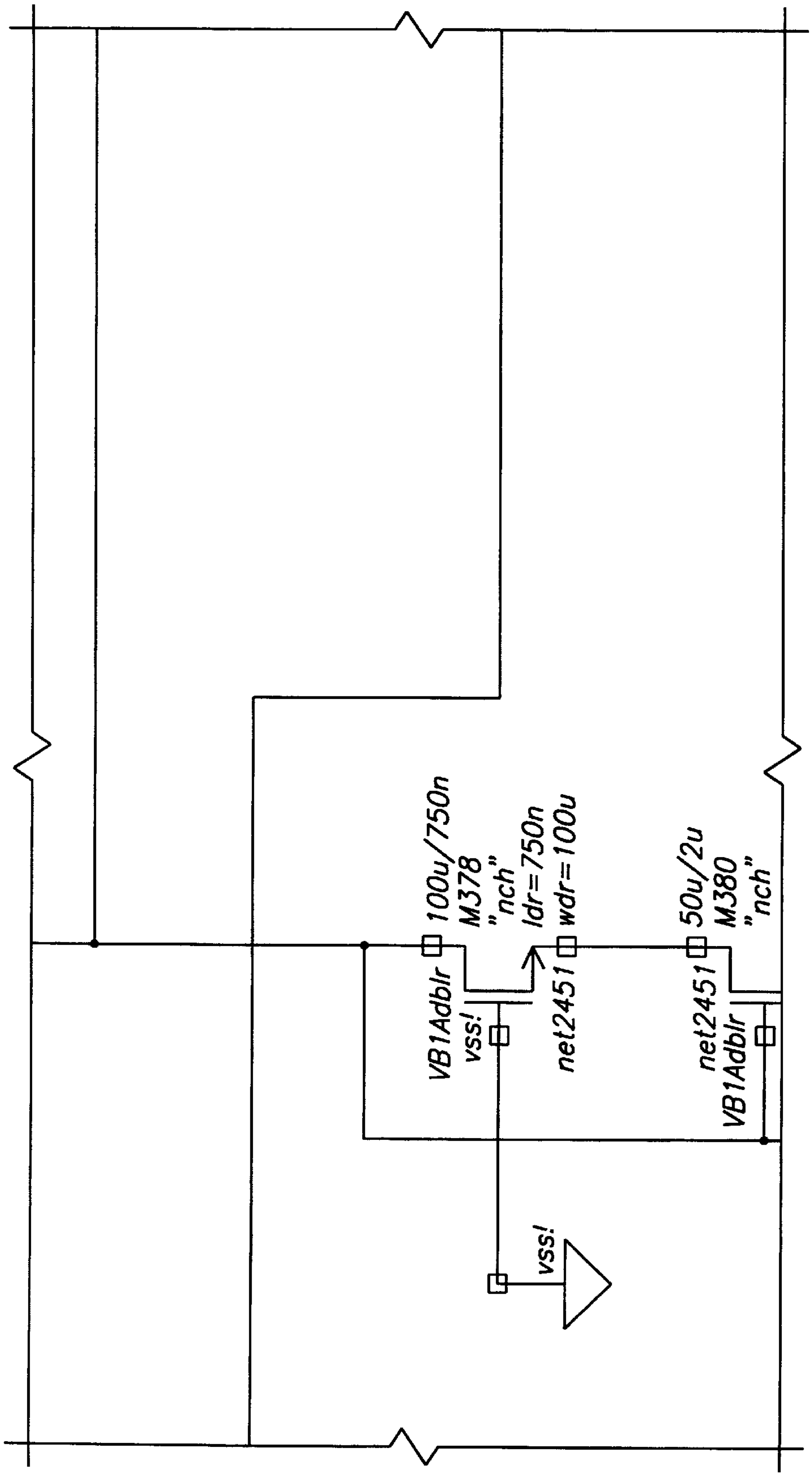
Fig. 8.0607IH

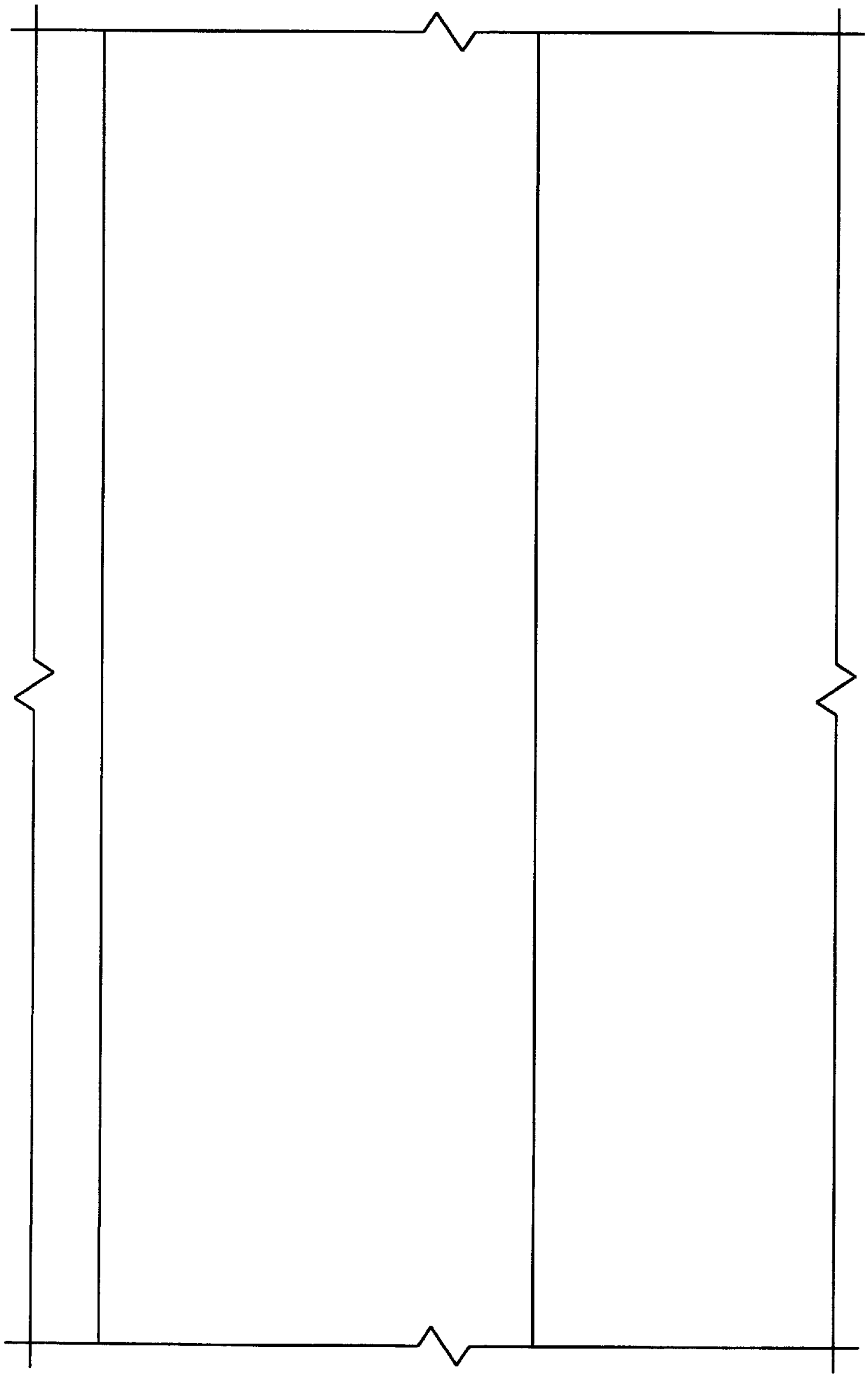
FIG. 8.050711

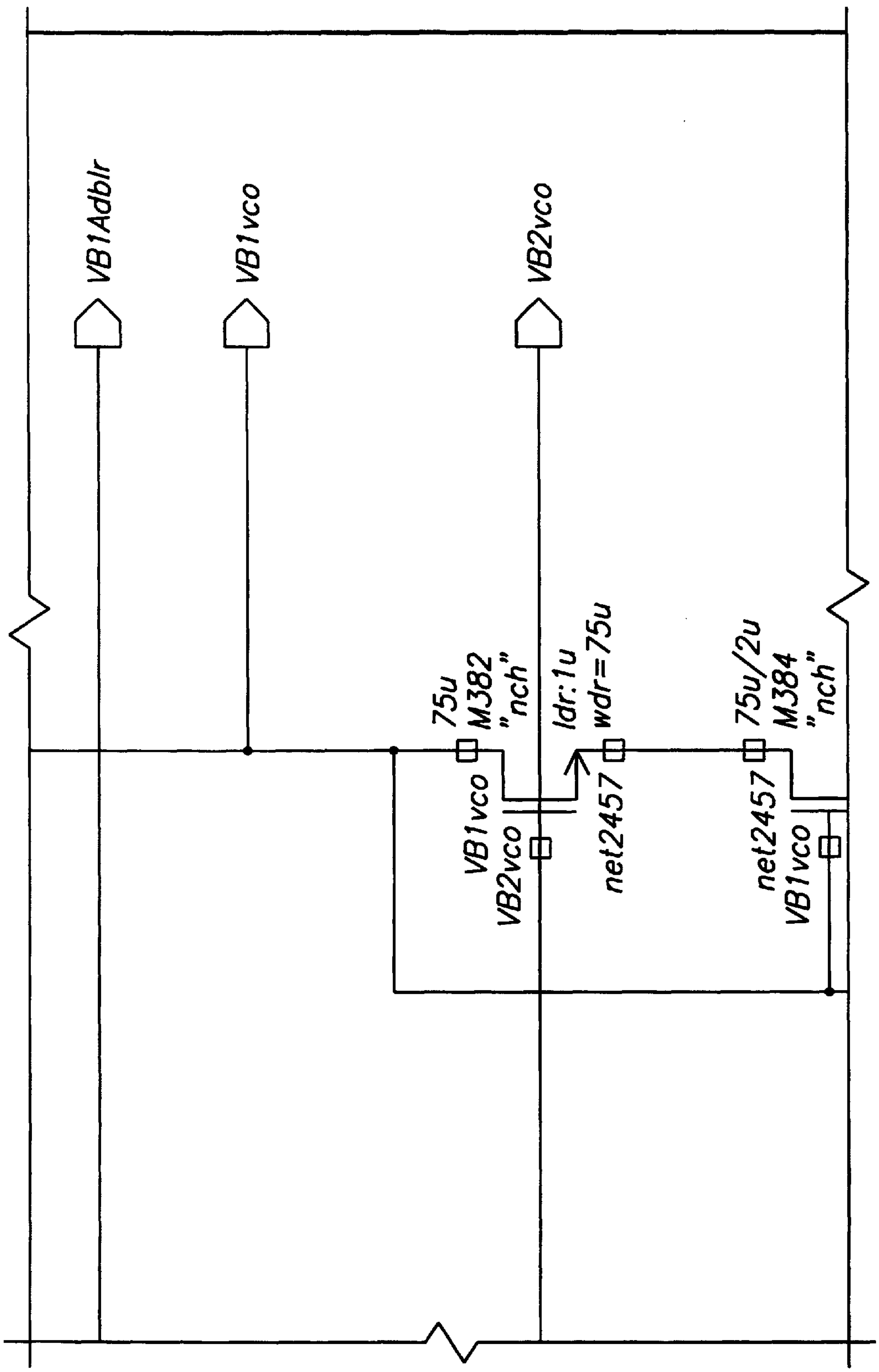
Fig. 8.06071J

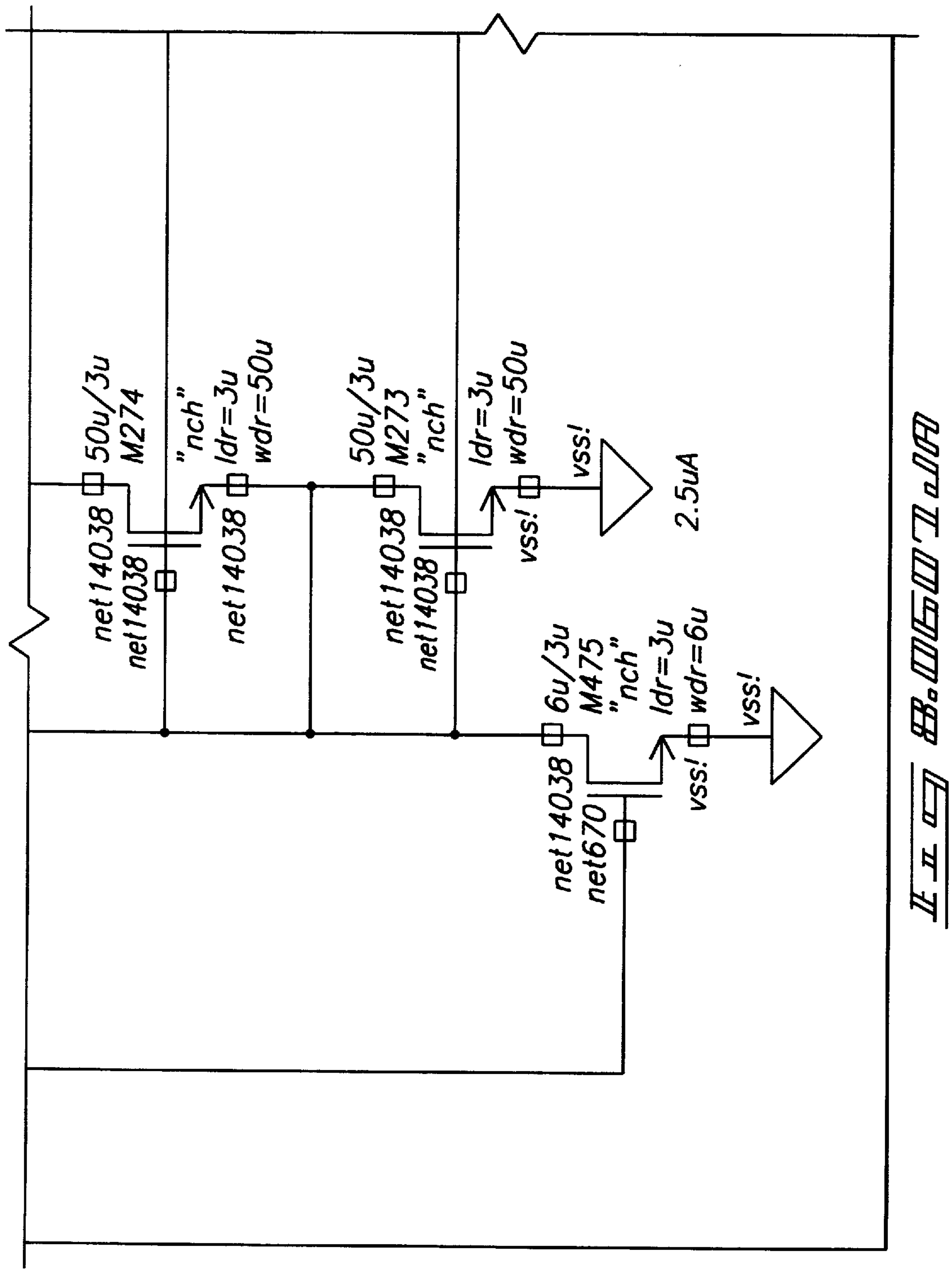
50u/3u
M274
"nch"
ldr=3u
wdr=50u
net14038
net14038
net14038
50u/3u
M273
"nch"
ldr=3u
wdr=50u
net14038
net14038
vss!
vss!
2.5uA
6u/3u
M475
"nch"
ldr=3u
wdr=6u
net14038
net670
vss!
vss!

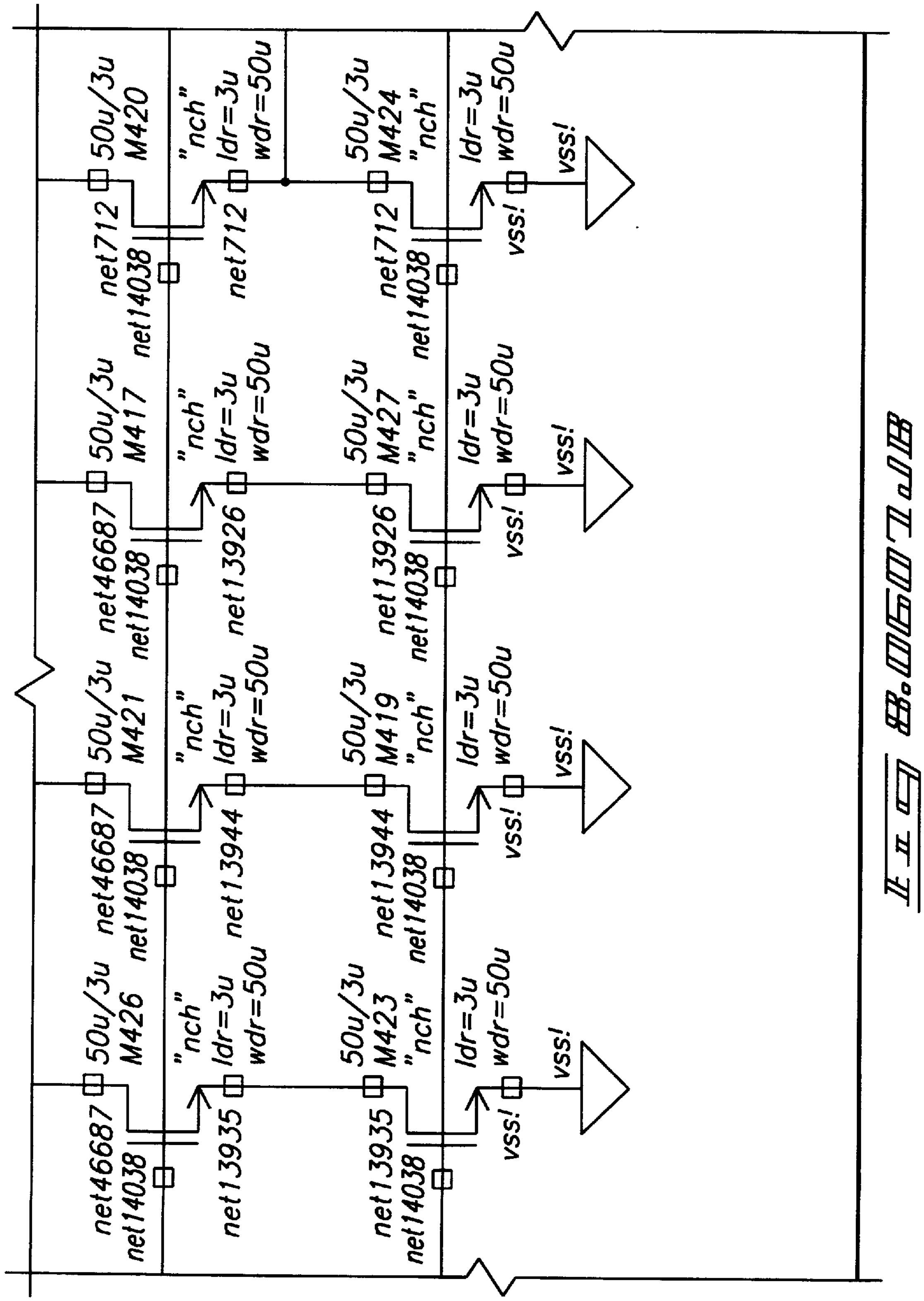
50u/3u
M420
"nch"
ldr=3u
wdr=50u
net712
net14038
M424
vss!
M417
M427
net46687
net13926
M421
M419
net13944
M426
M423
net13935

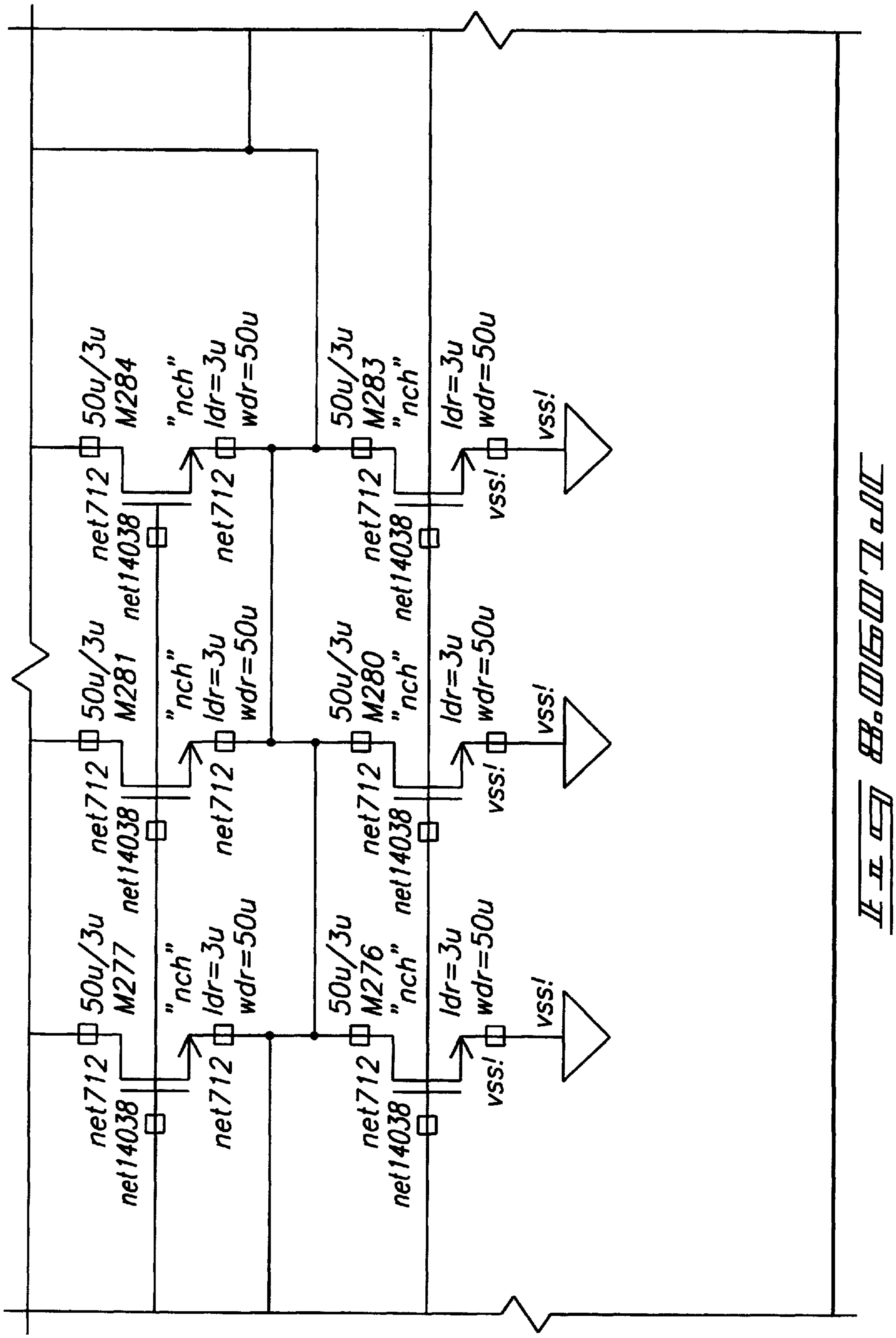
50u/3u
M284
"nch"
ldr=3u
wdr=50u
net712
net14038
net712
50u/3u
M283
"nch"
ldr=3u
wdr=50u
net712
net14038
vss!
vss!
50u/3u
M281
"nch"
ldr=3u
wdr=50u
net712
net14038
net712
50u/3u
M280
"nch"
ldr=3u
wdr=50u
net712
net14038
vss!
vss!
50u/3u
M277
"nch"
ldr=3u
wdr=50u
net712
net14038
net712
50u/3u
M276
"nch"
ldr=3u
wdr=50u
net712
net14038
vss!
vss!

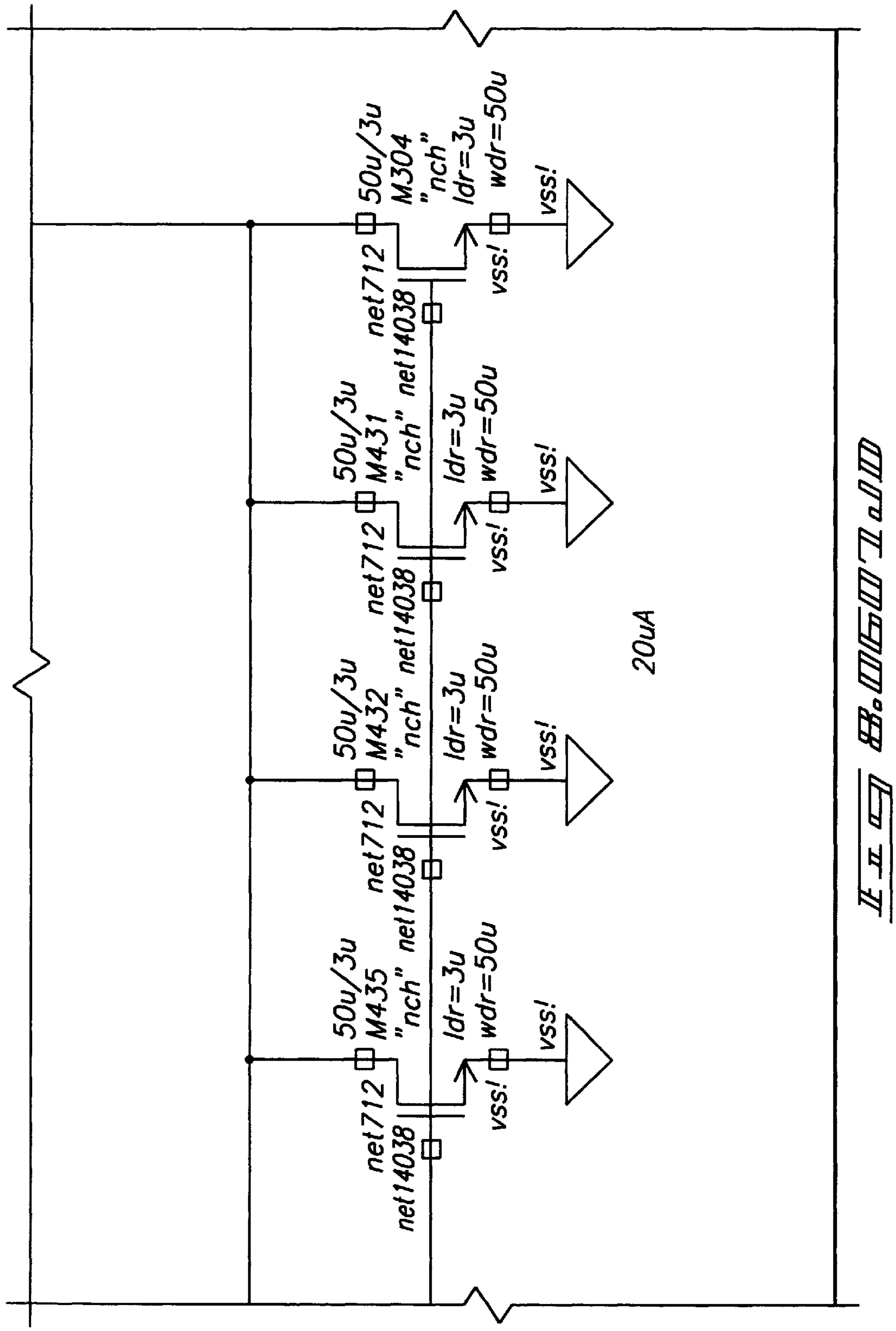
FIG. 8.0607AD

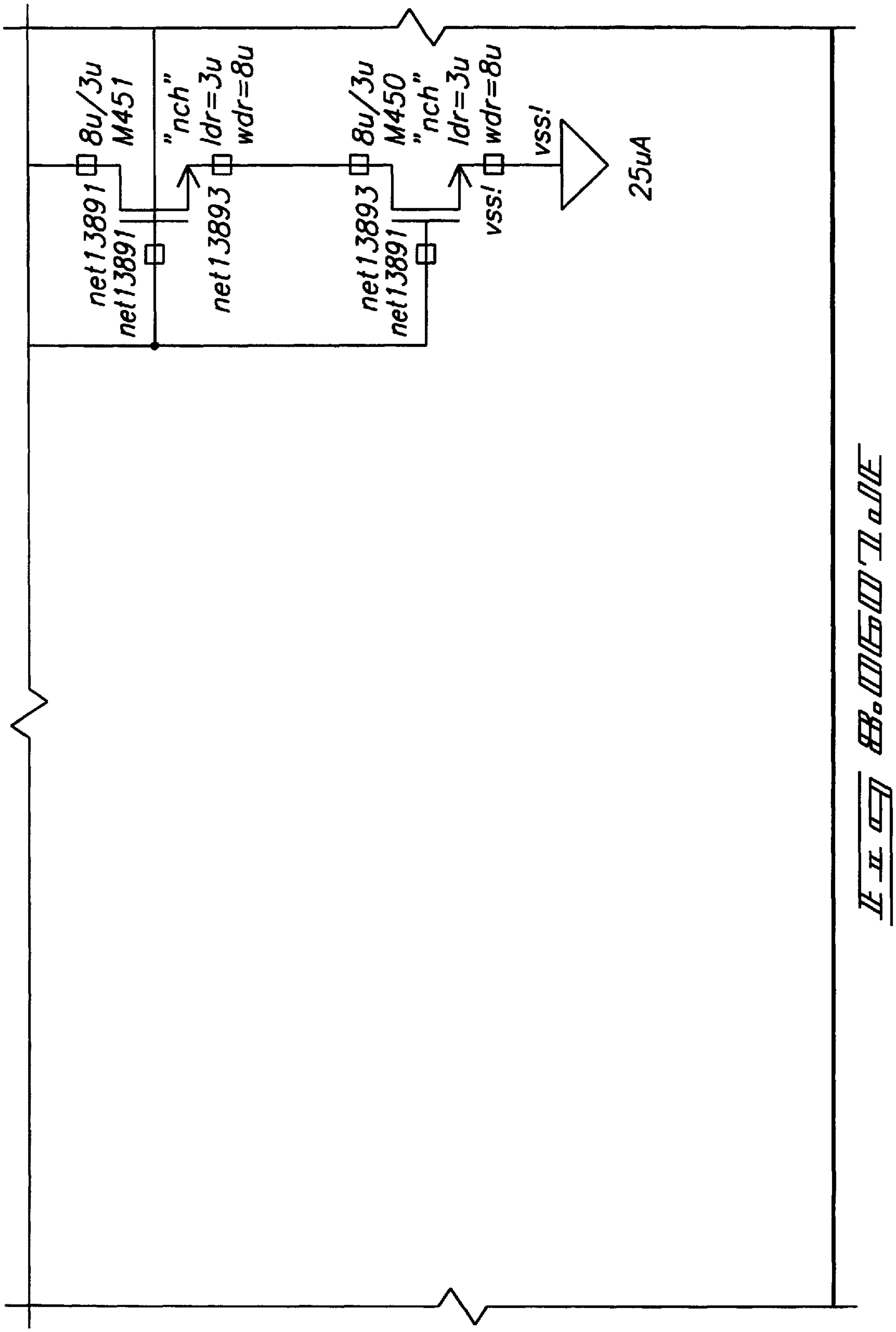
Fig. 8.060.7aE

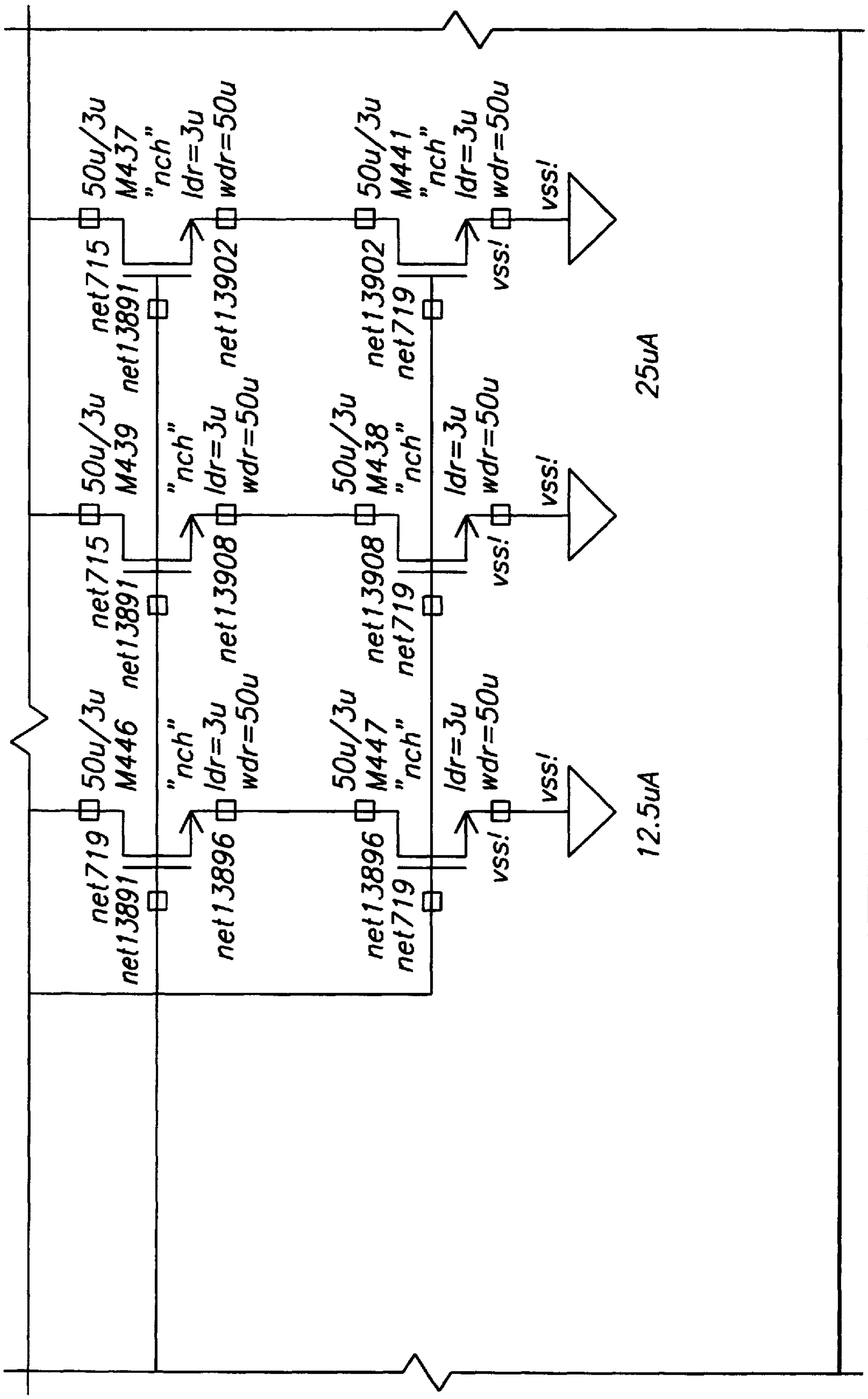
Fig. 8.0607AF

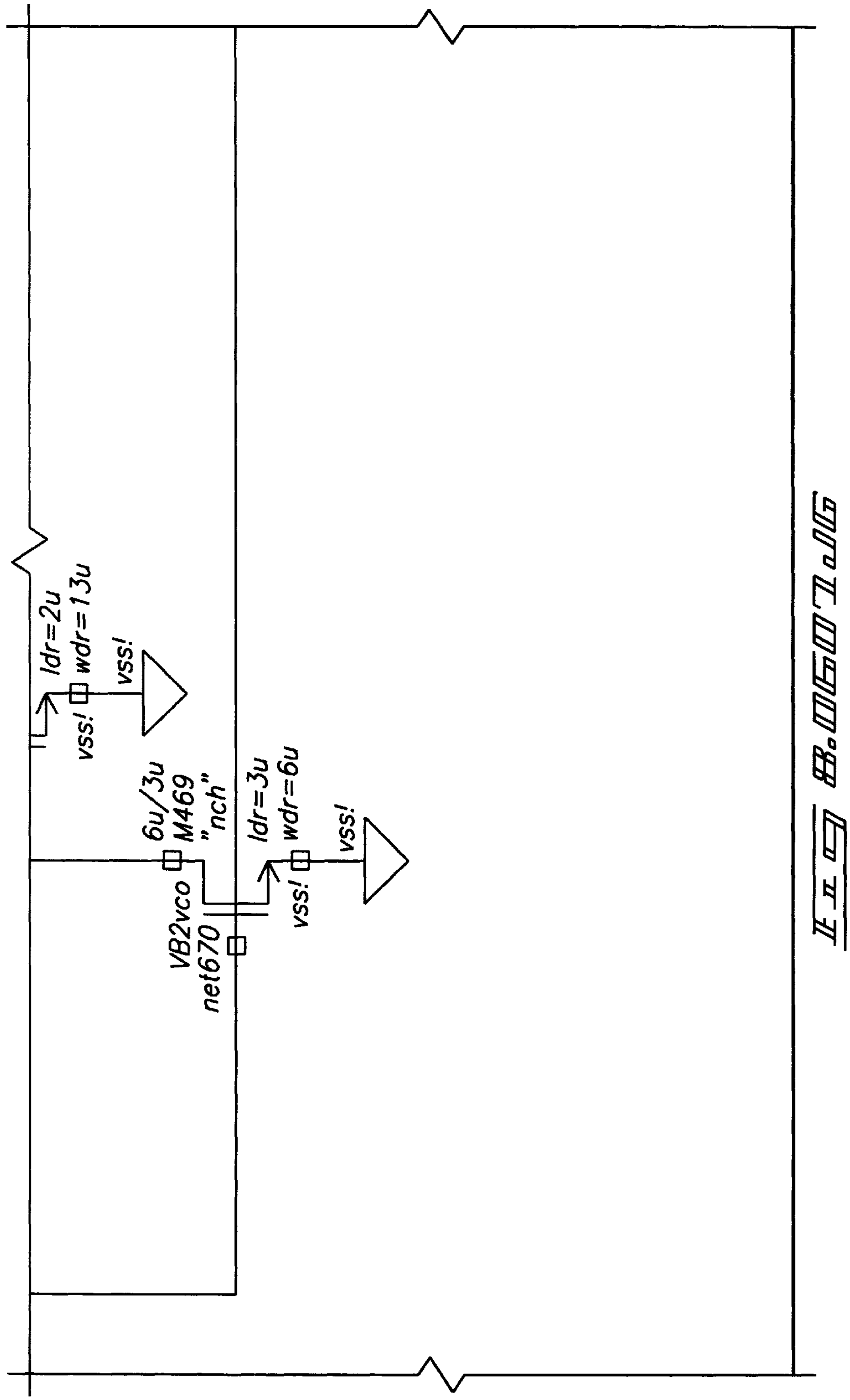
Fig. 8.0607AG

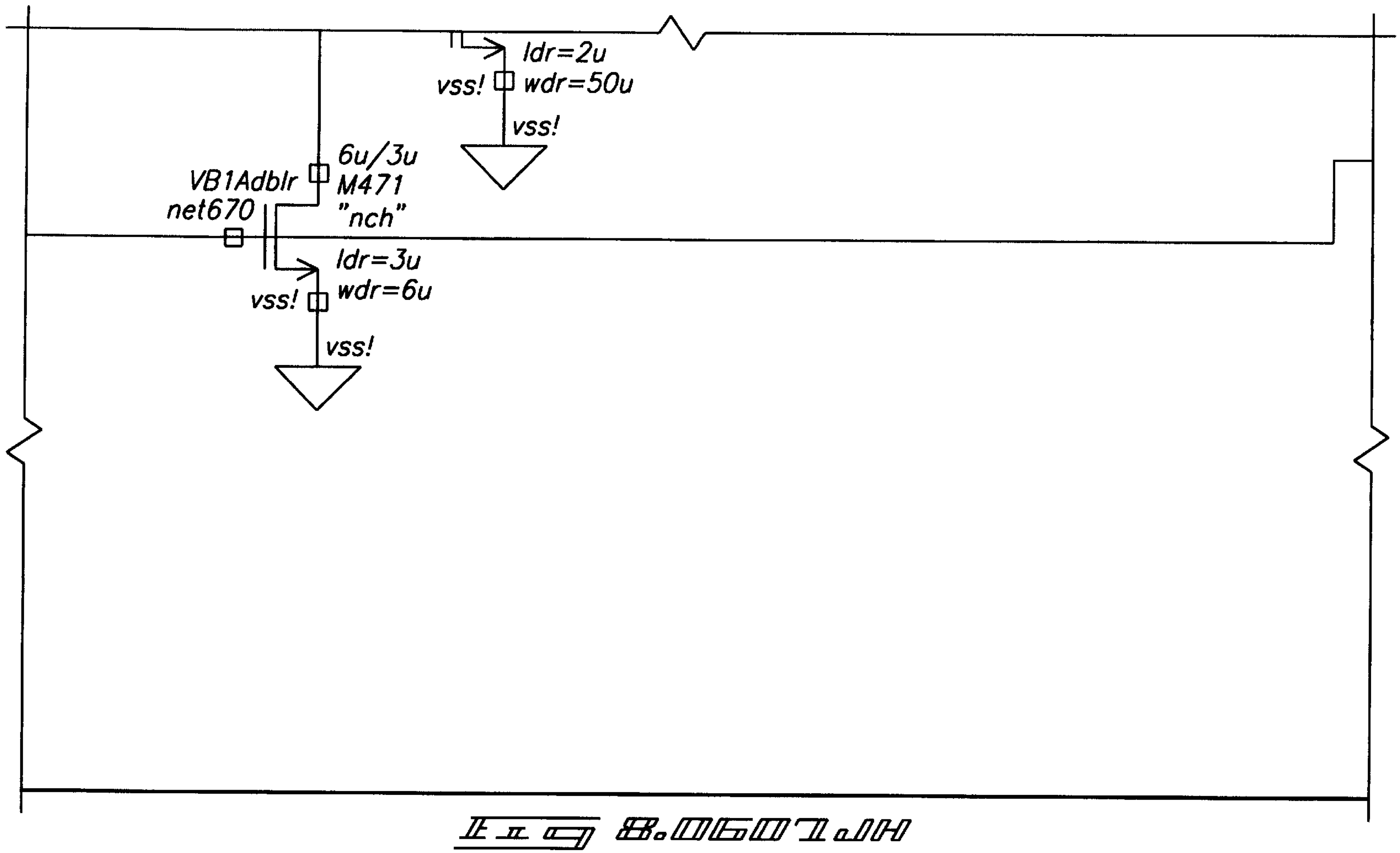
FIG. 8.0607JH

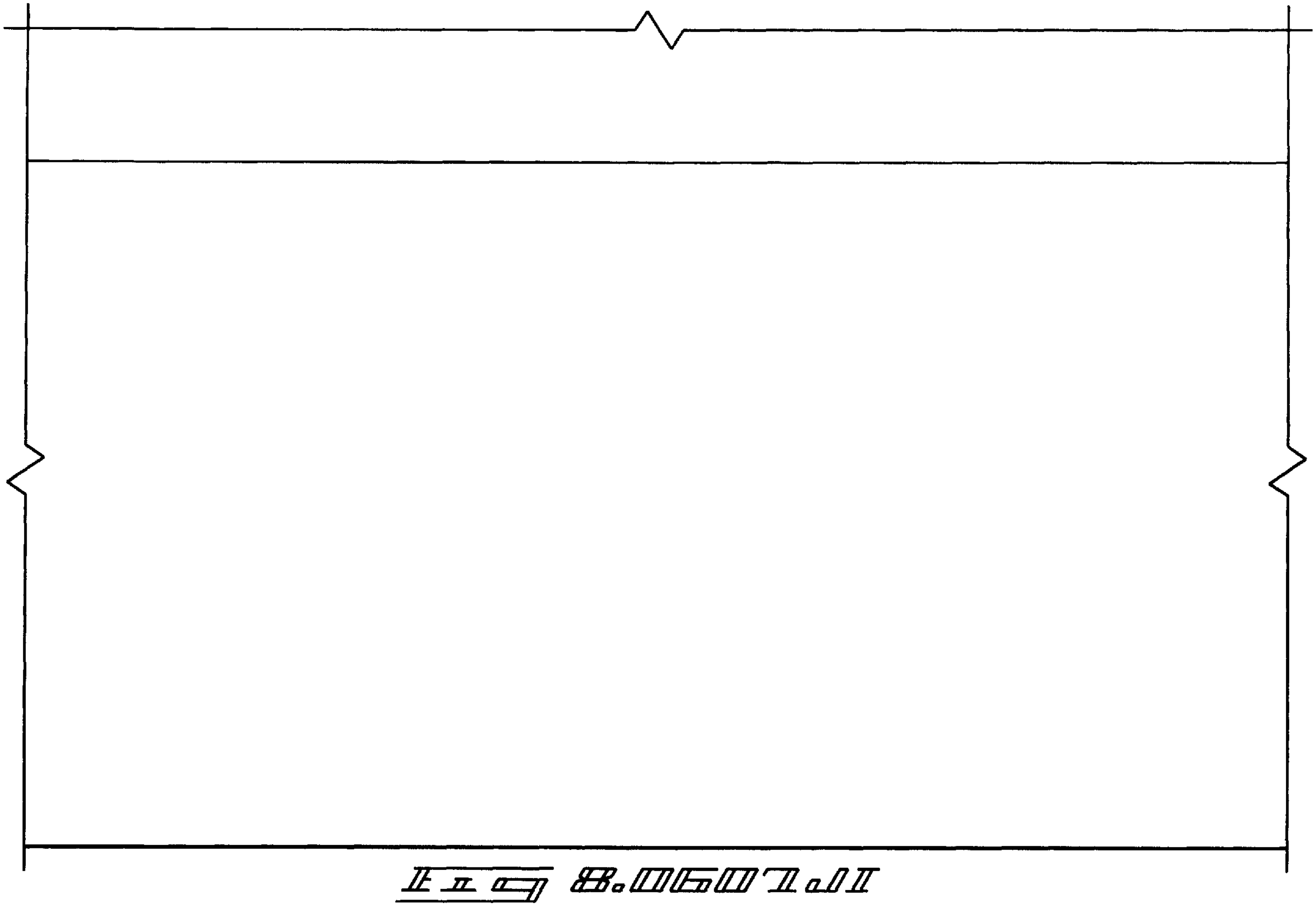
Fig. 8.0607.11

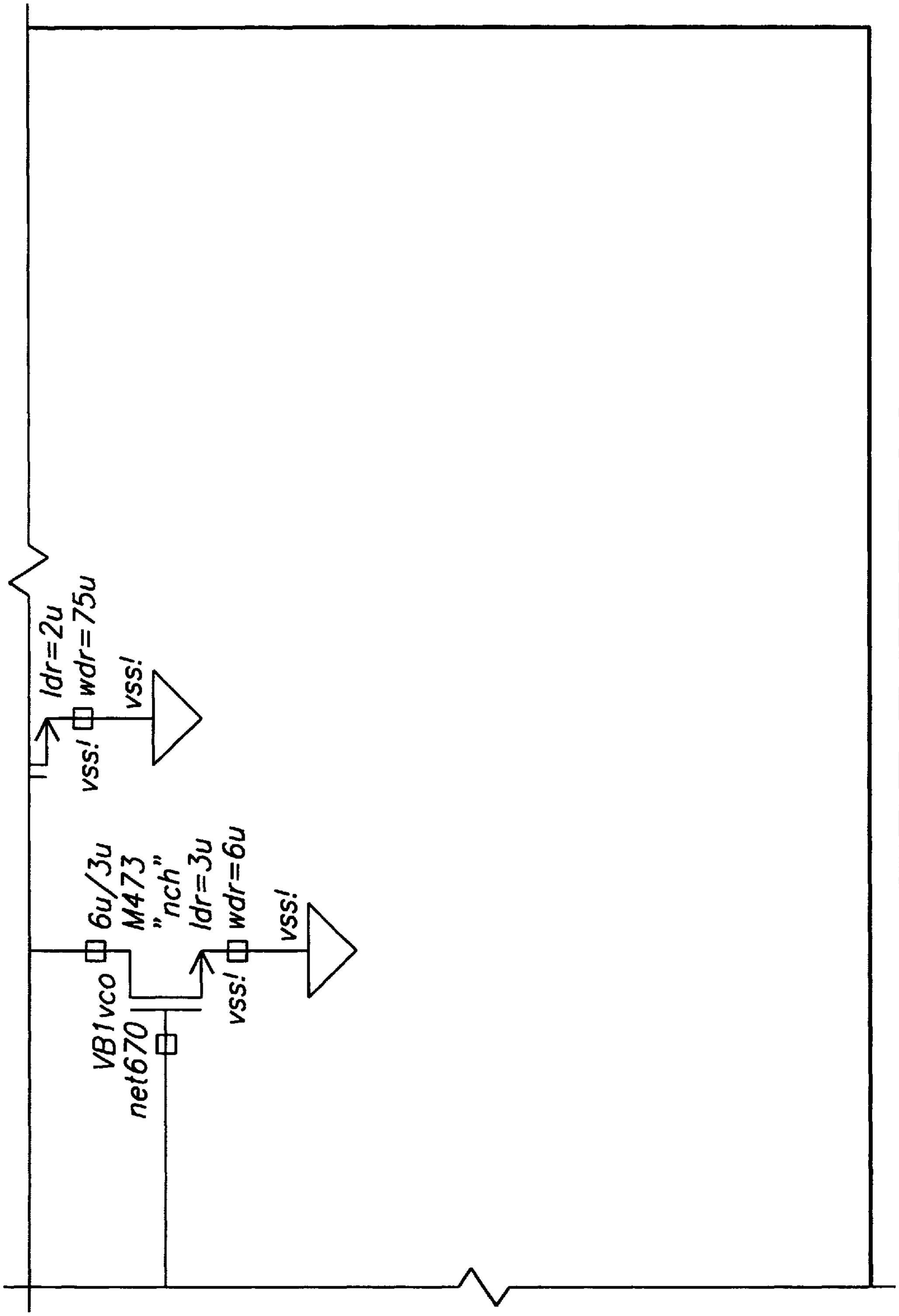
Fig. 8.0607

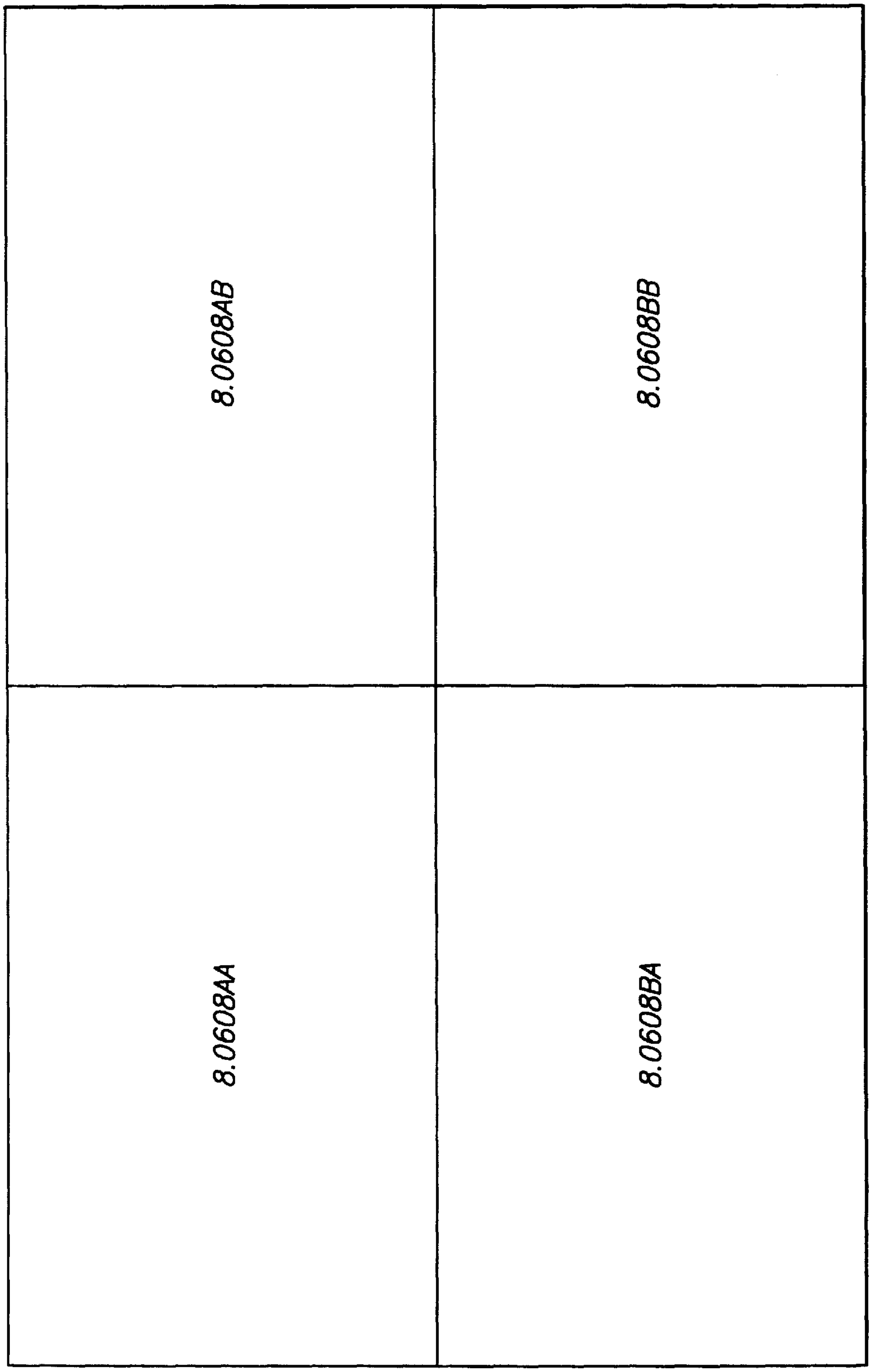
Fig. 8.0608

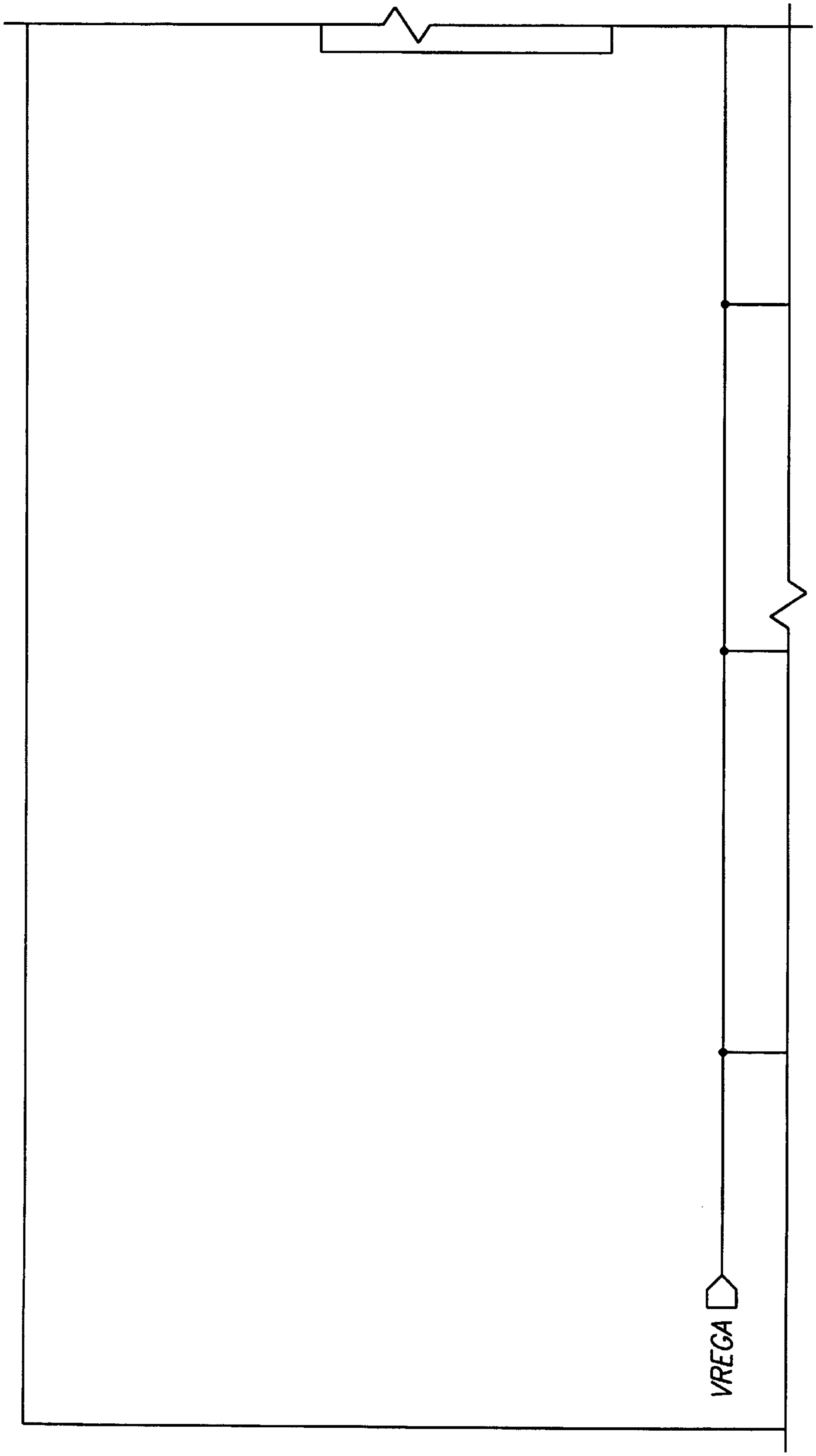
Fig. 8.0608AA

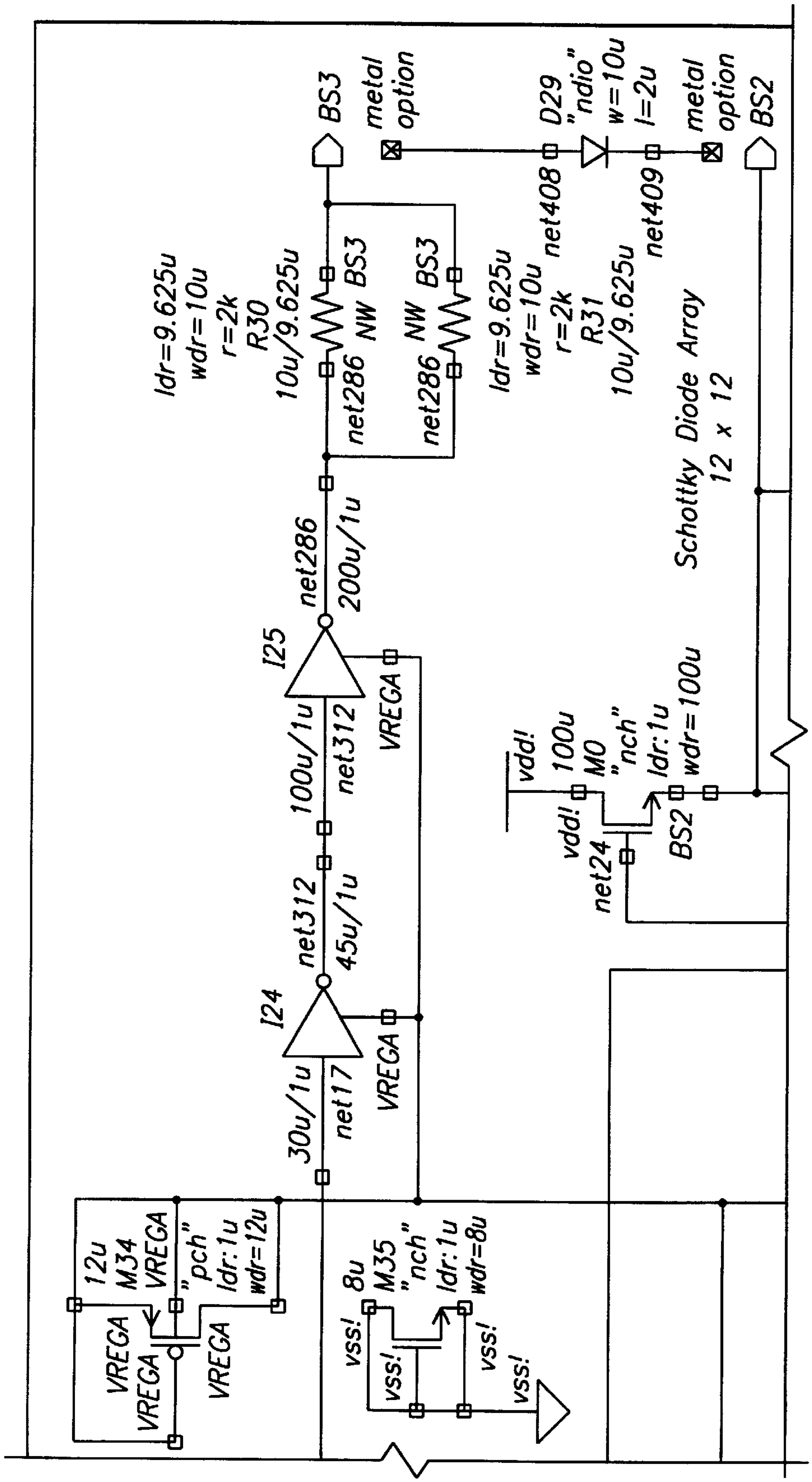
FIG. 8.068AB

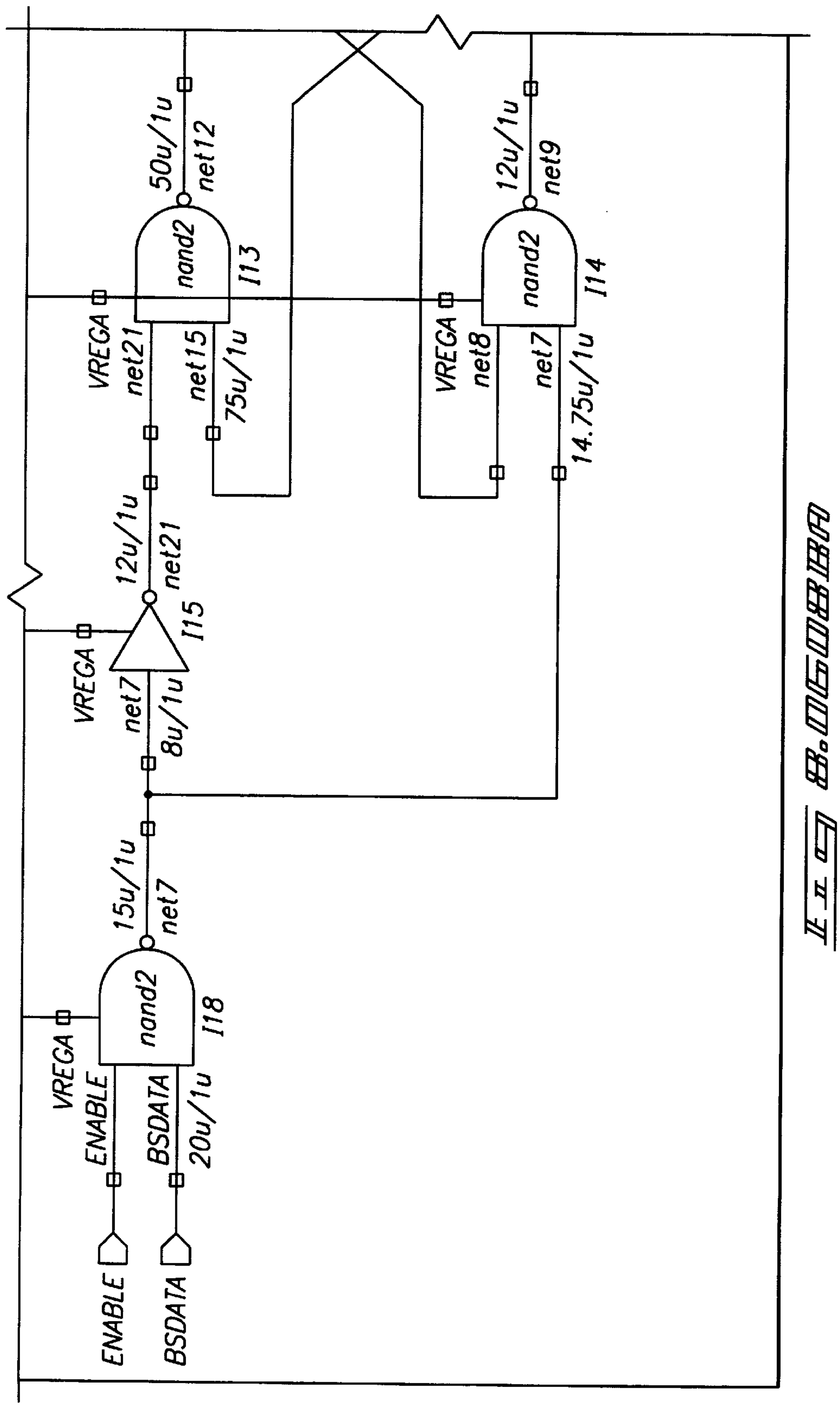
FIG. 8.06BA

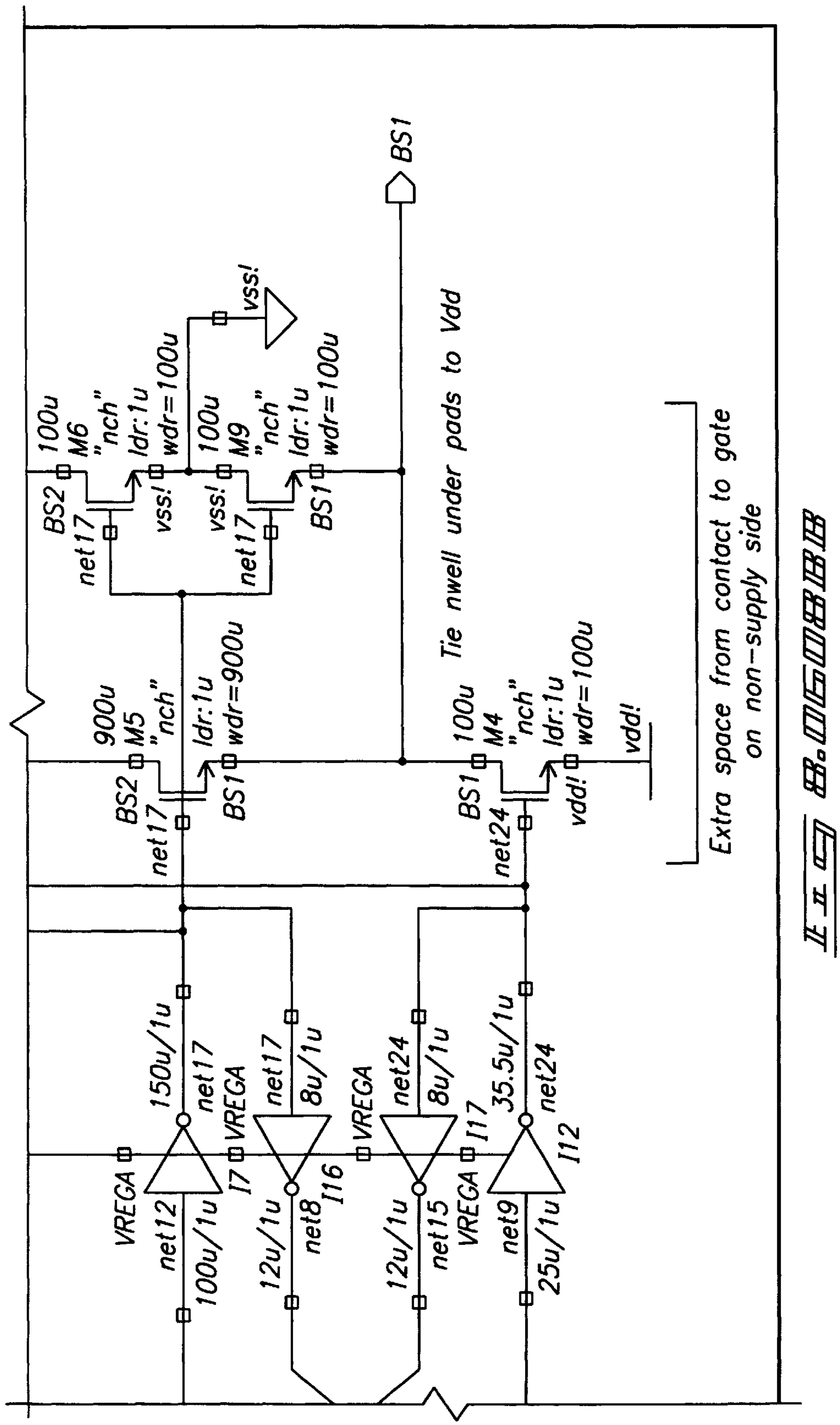
FIG. 8.06.08BB

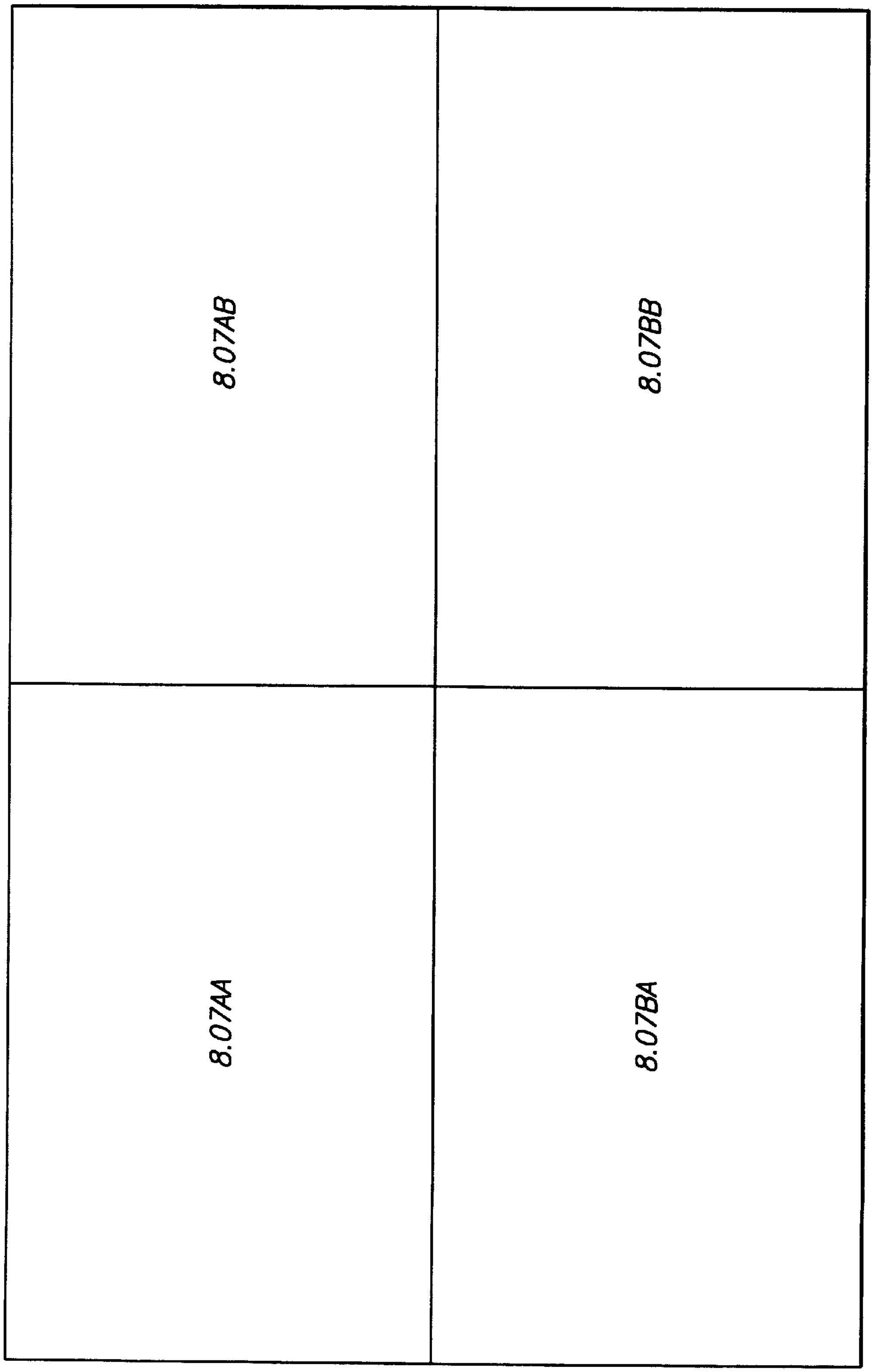
Fig. 8.07

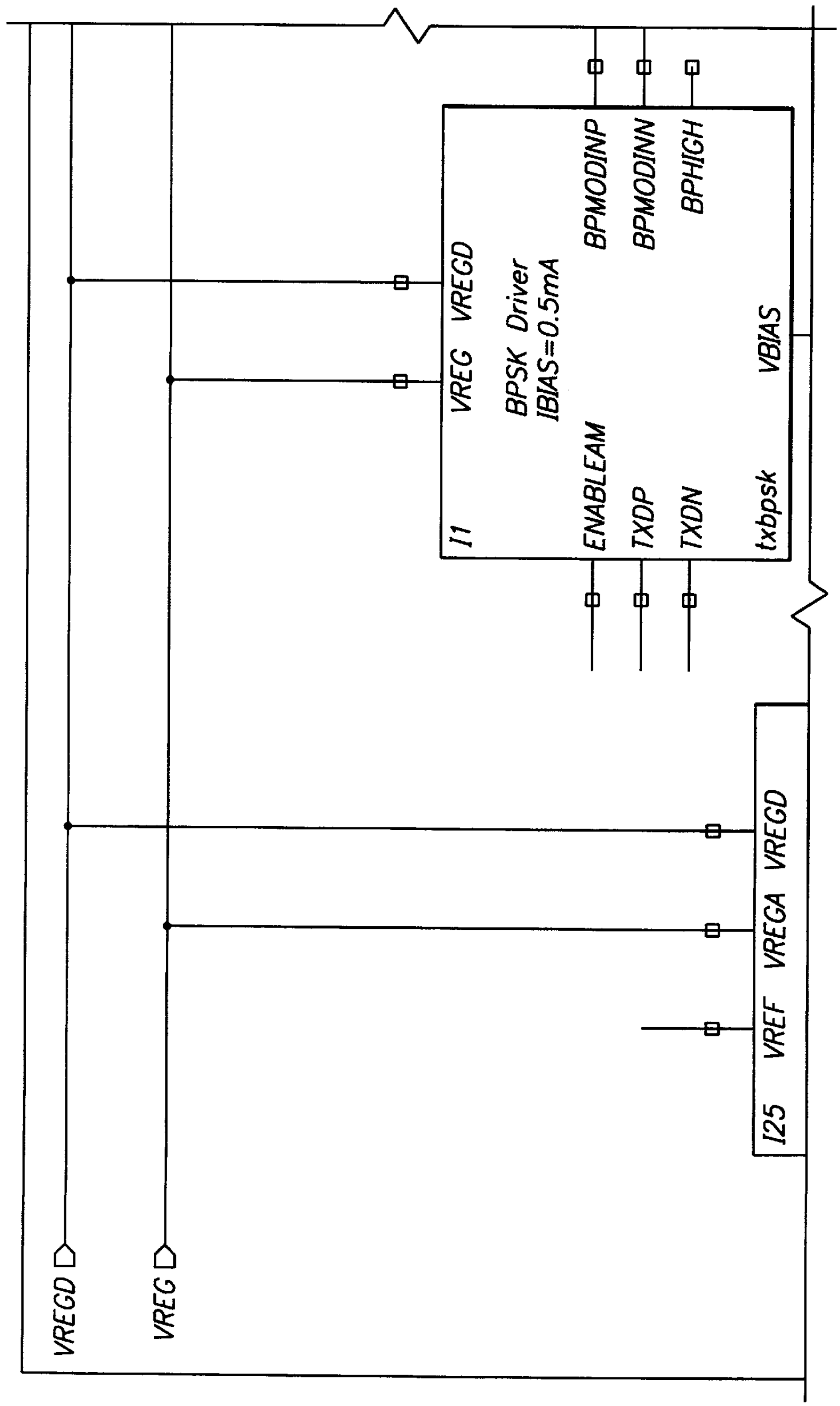
Fig. 8.07AA

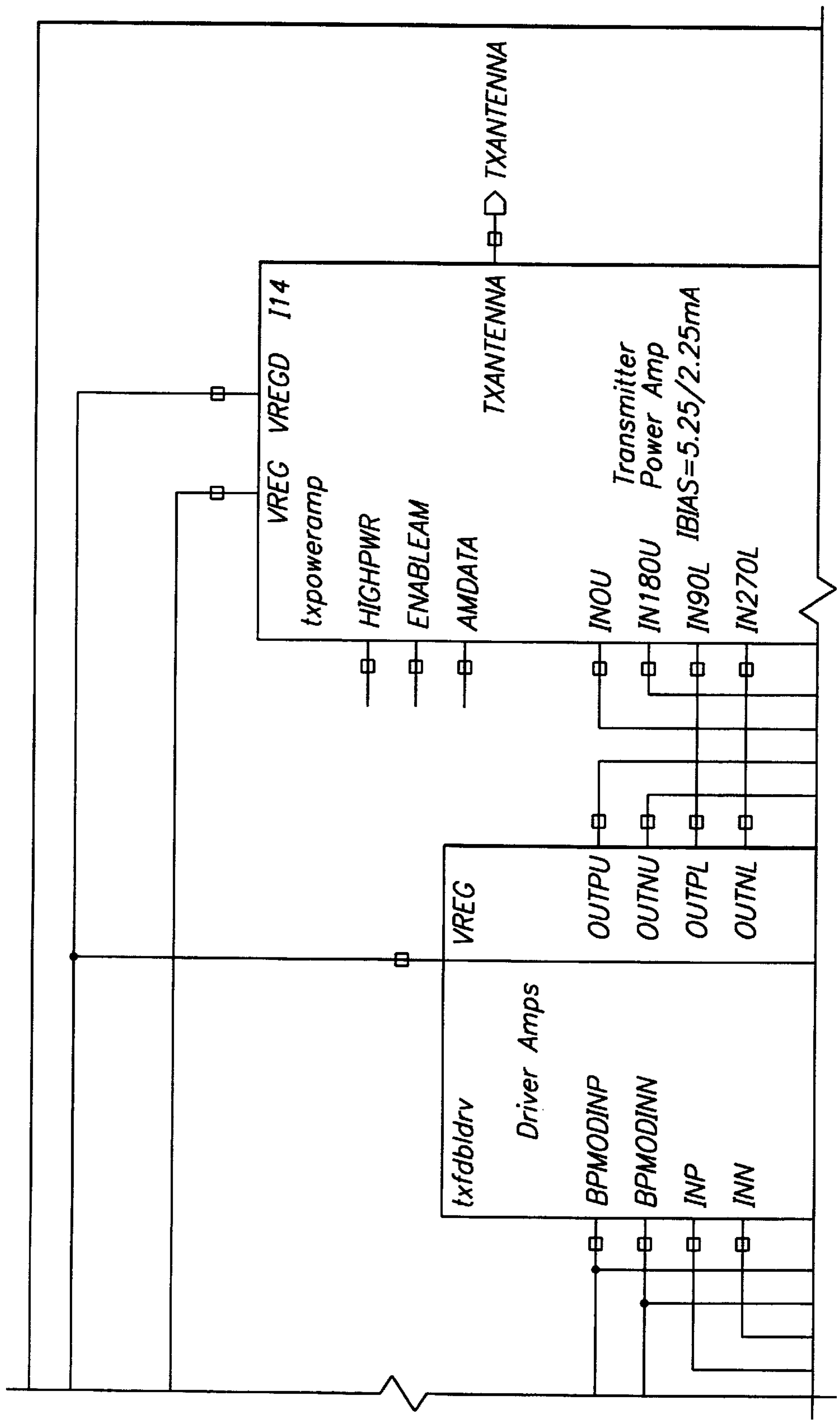
FIG. 8.07AB

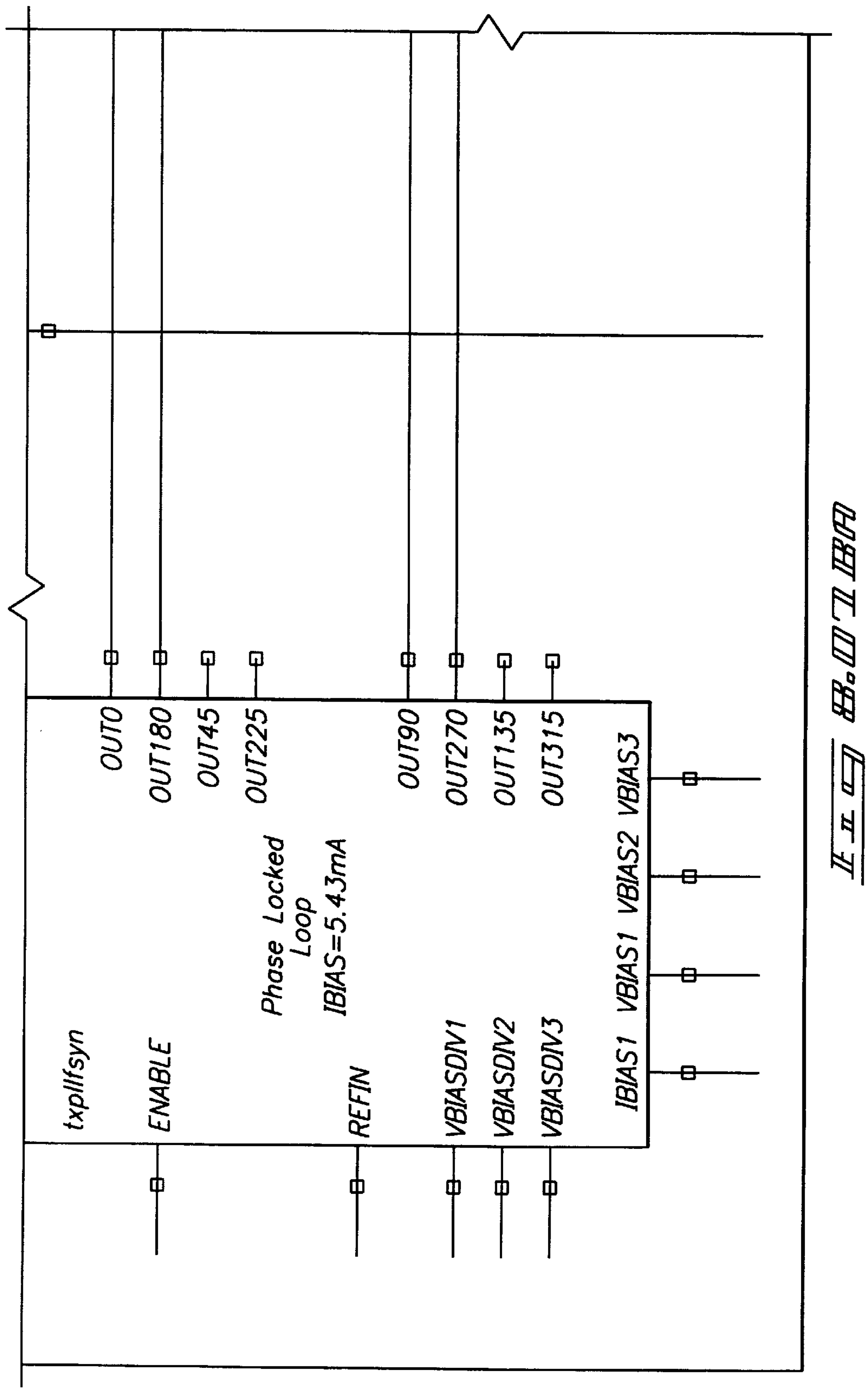
Fig. 8.07.8A

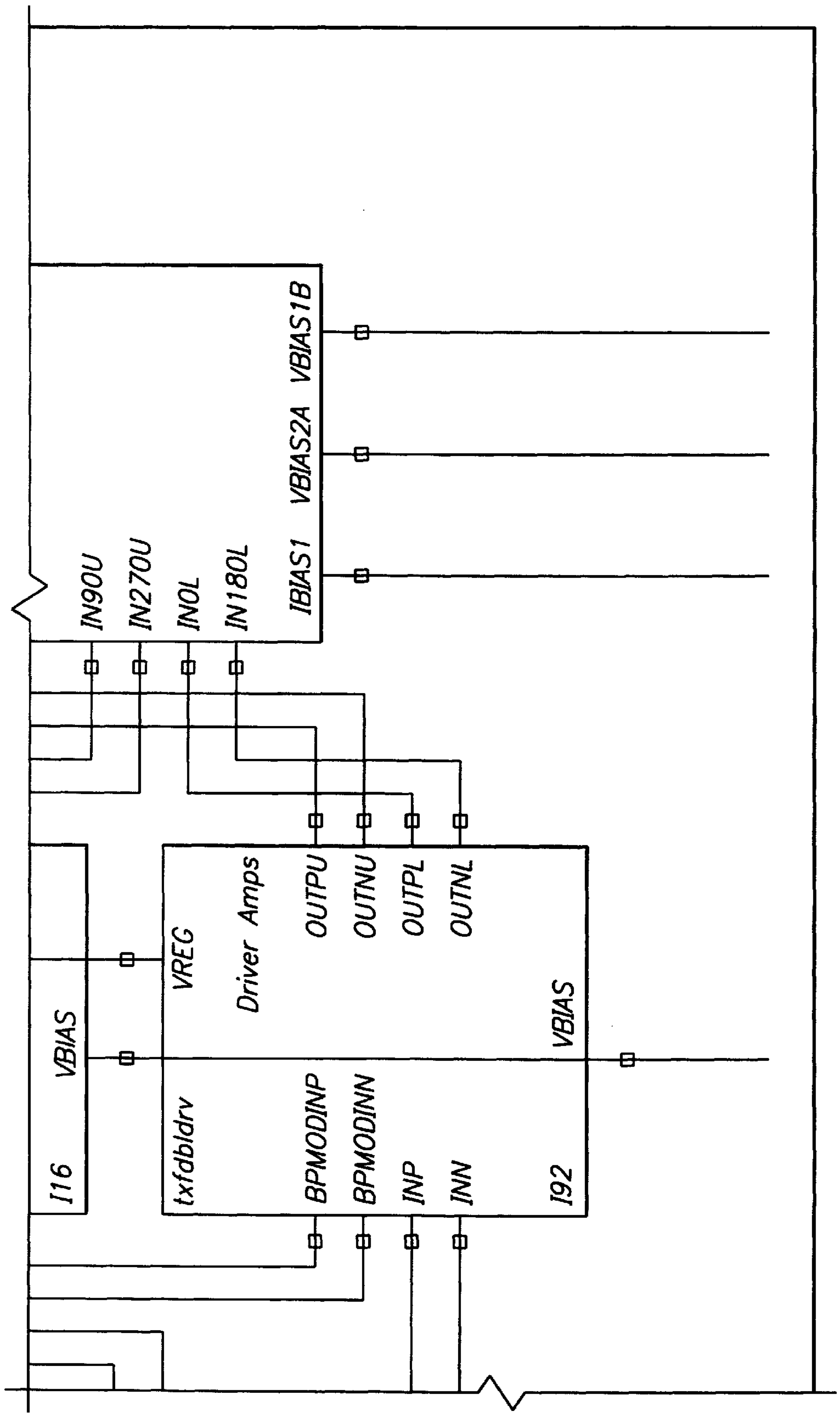
FIG. 8.07BB

| | |
|---|---|
| 8.0701AA | 8.0701AB |
| 8.0701BA | 8.0701BB |
| 8.0701CA | 8.0701CB |

FIG. 8.0701

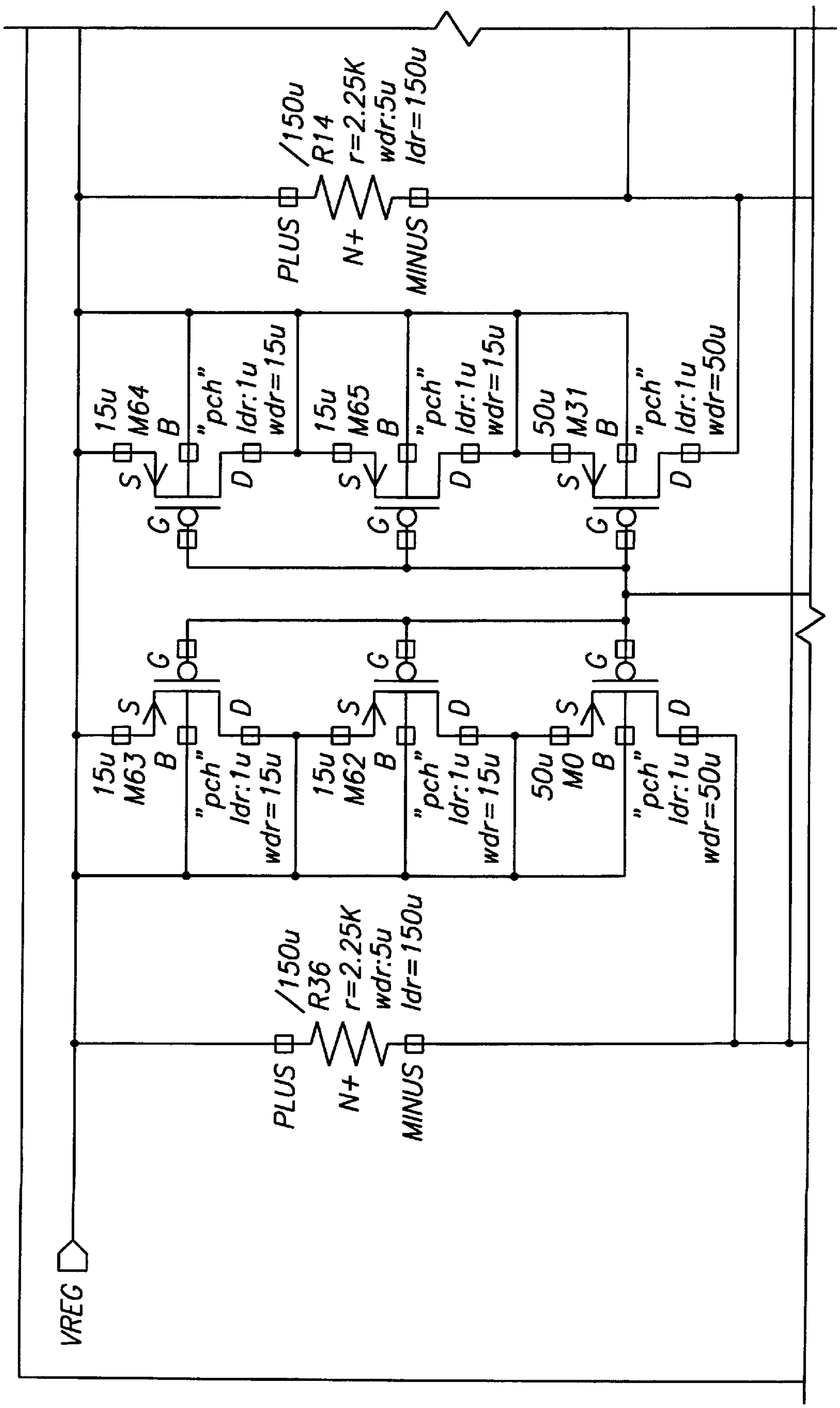
FIG. 8.0101AA

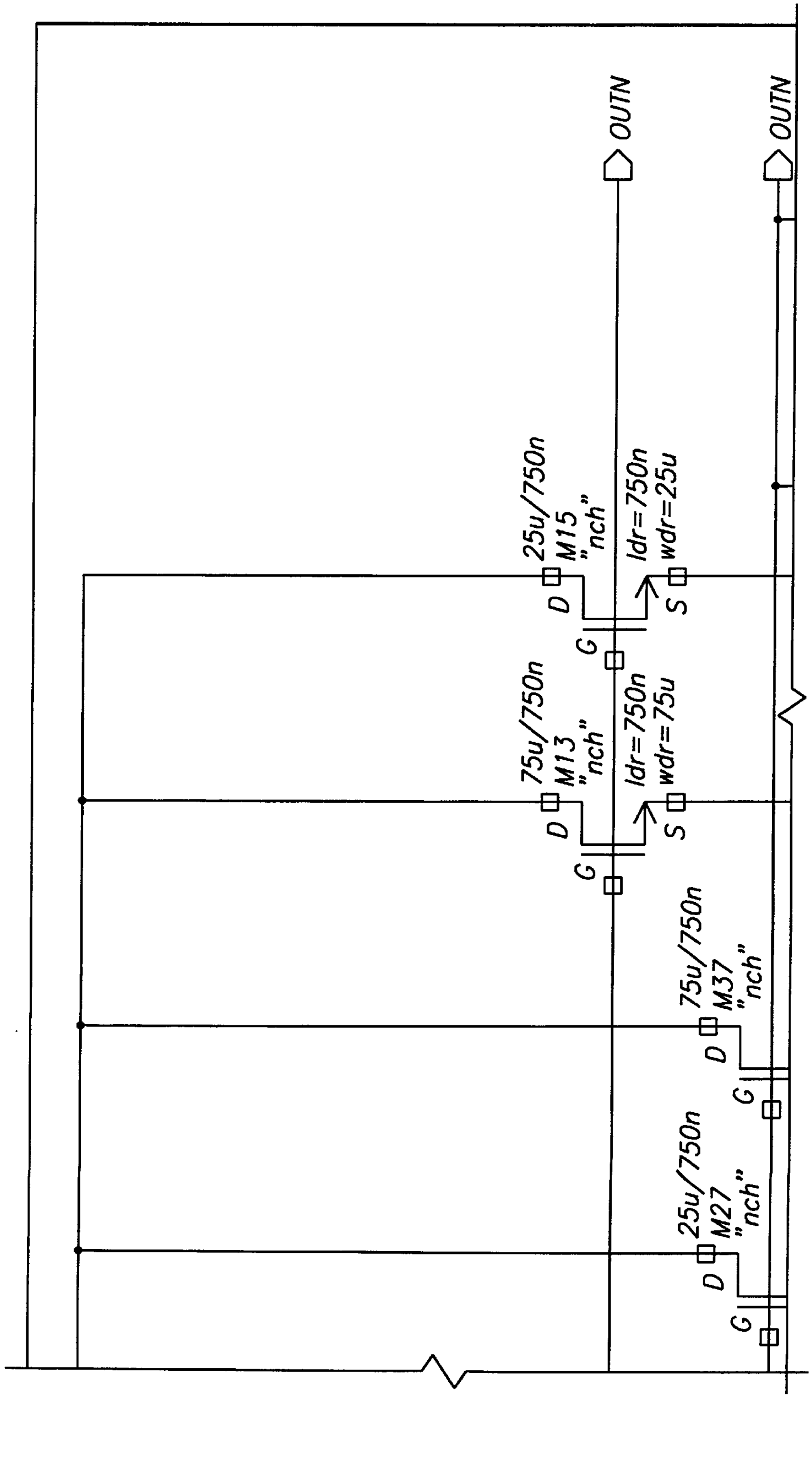
FIG. 8.0701AB

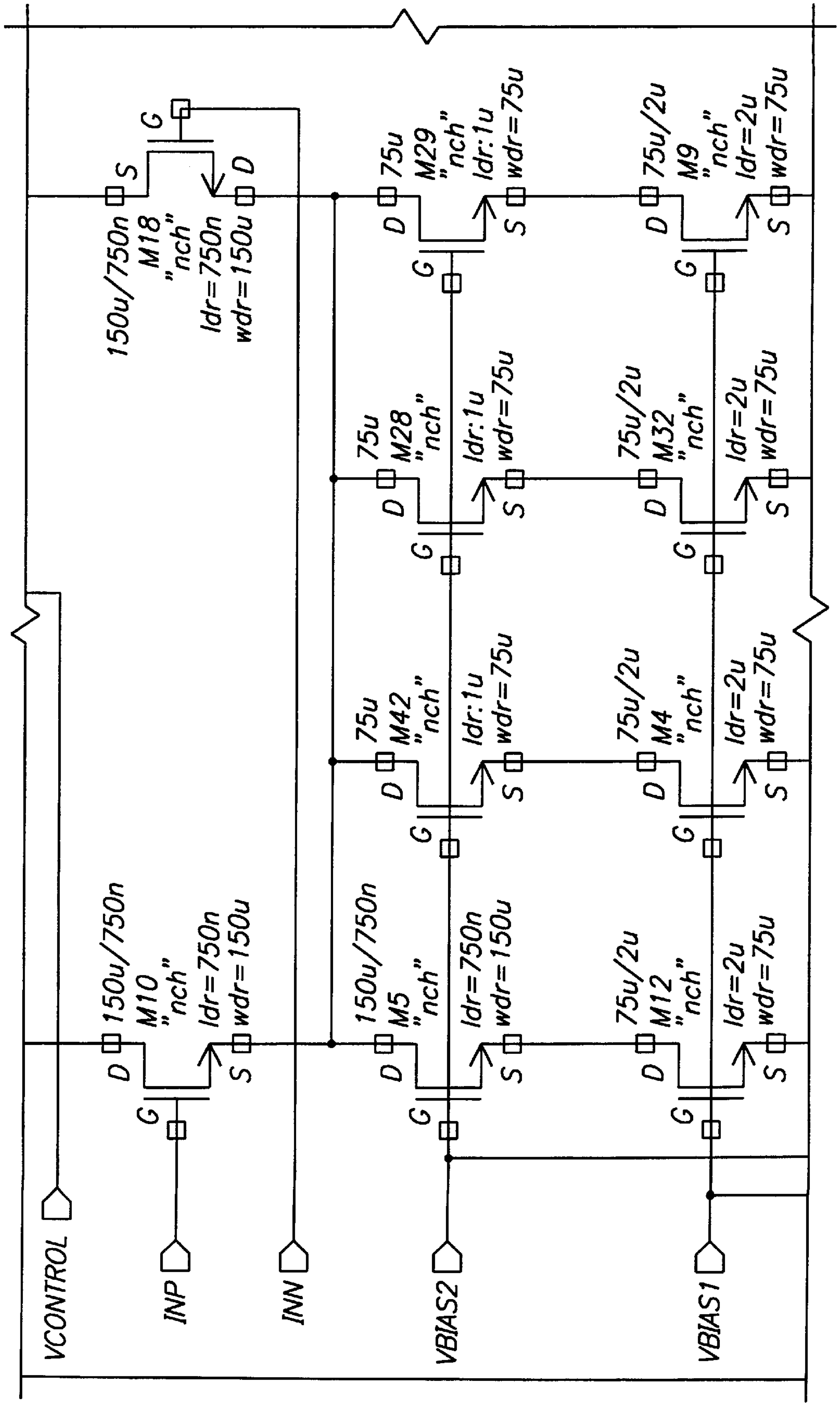
VCONTROL
INP
INN
VBIAS2
VBIAS1
150u/750n M18 "nch" ldr=750n wdr=150u
150u/750n M10 "nch" ldr=750n wdr=150u
150u/750n M5 "nch" ldr=750n wdr=150u
75u M29 "nch" ldr:1u wdr=75u
75u M28 "nch" ldr:1u wdr=75u
75u M42 "nch" ldr:1u wdr=75u
75u/2u M9 "nch" ldr=2u wdr=75u
75u/2u M32 "nch" ldr=2u wdr=75u
75u/2u M4 "nch" ldr=2u wdr=75u
75u/2u M12 "nch" ldr=2u wdr=75u

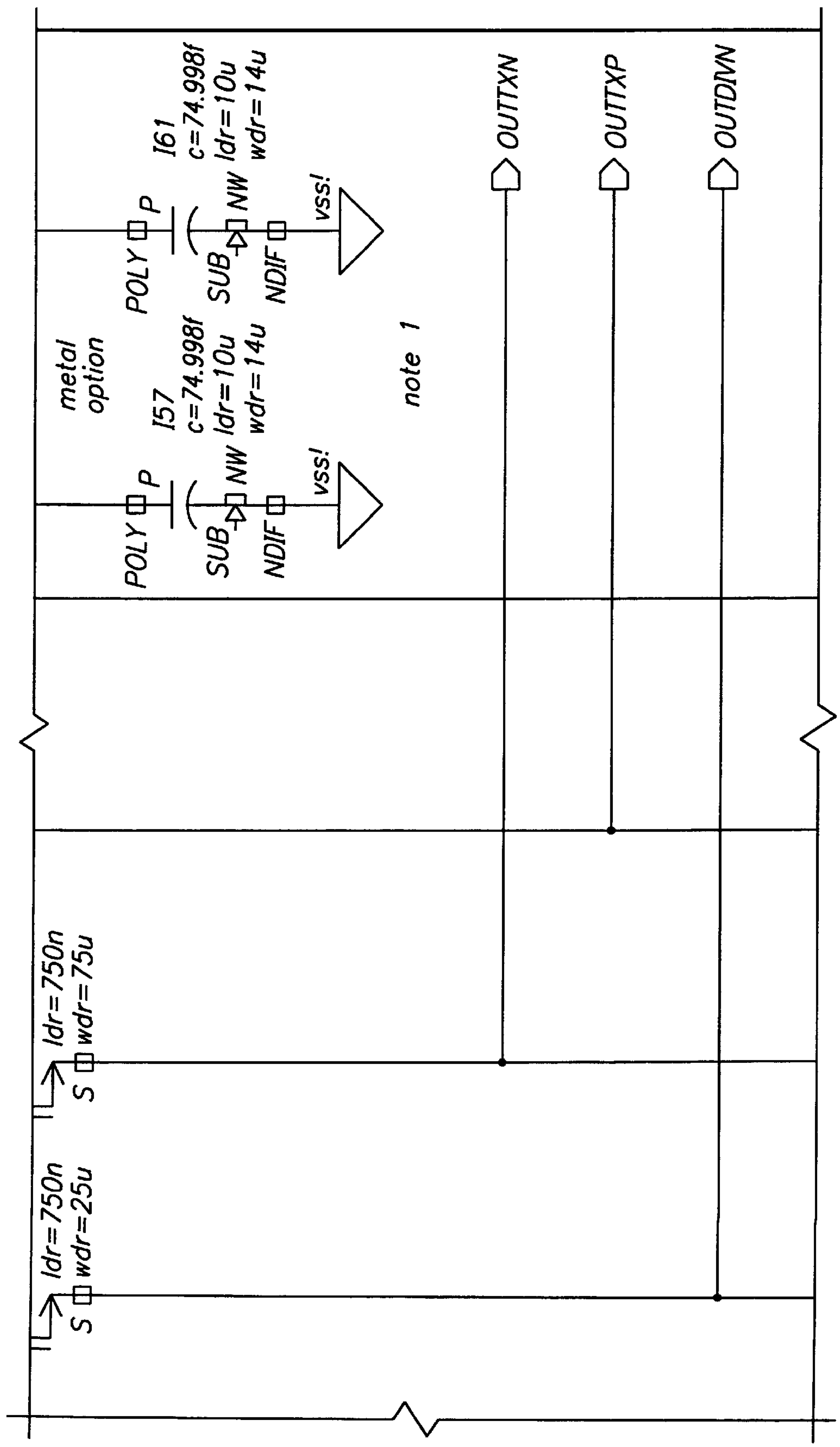
FIG. 8.070B

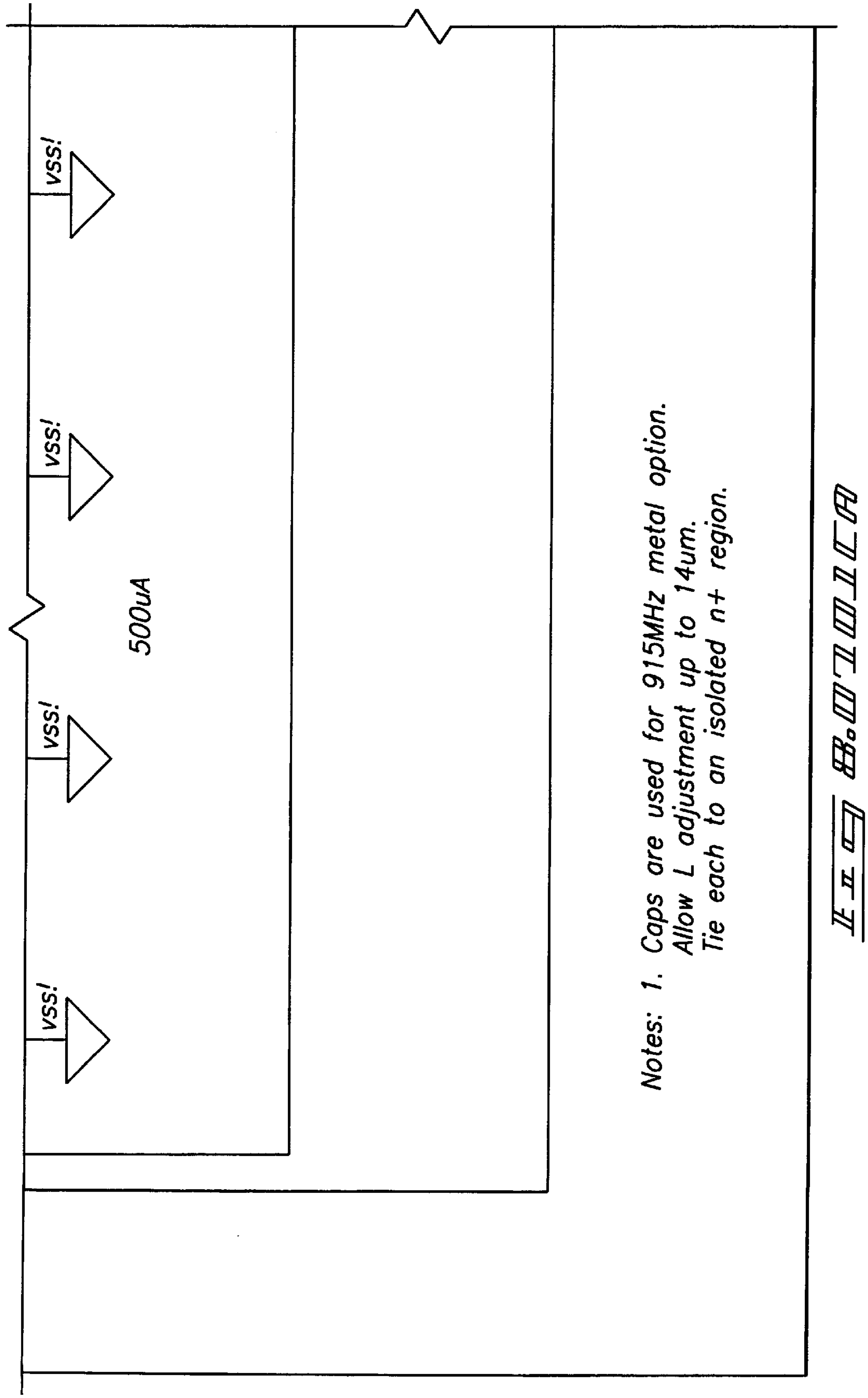
FIG. 8.07.01CA

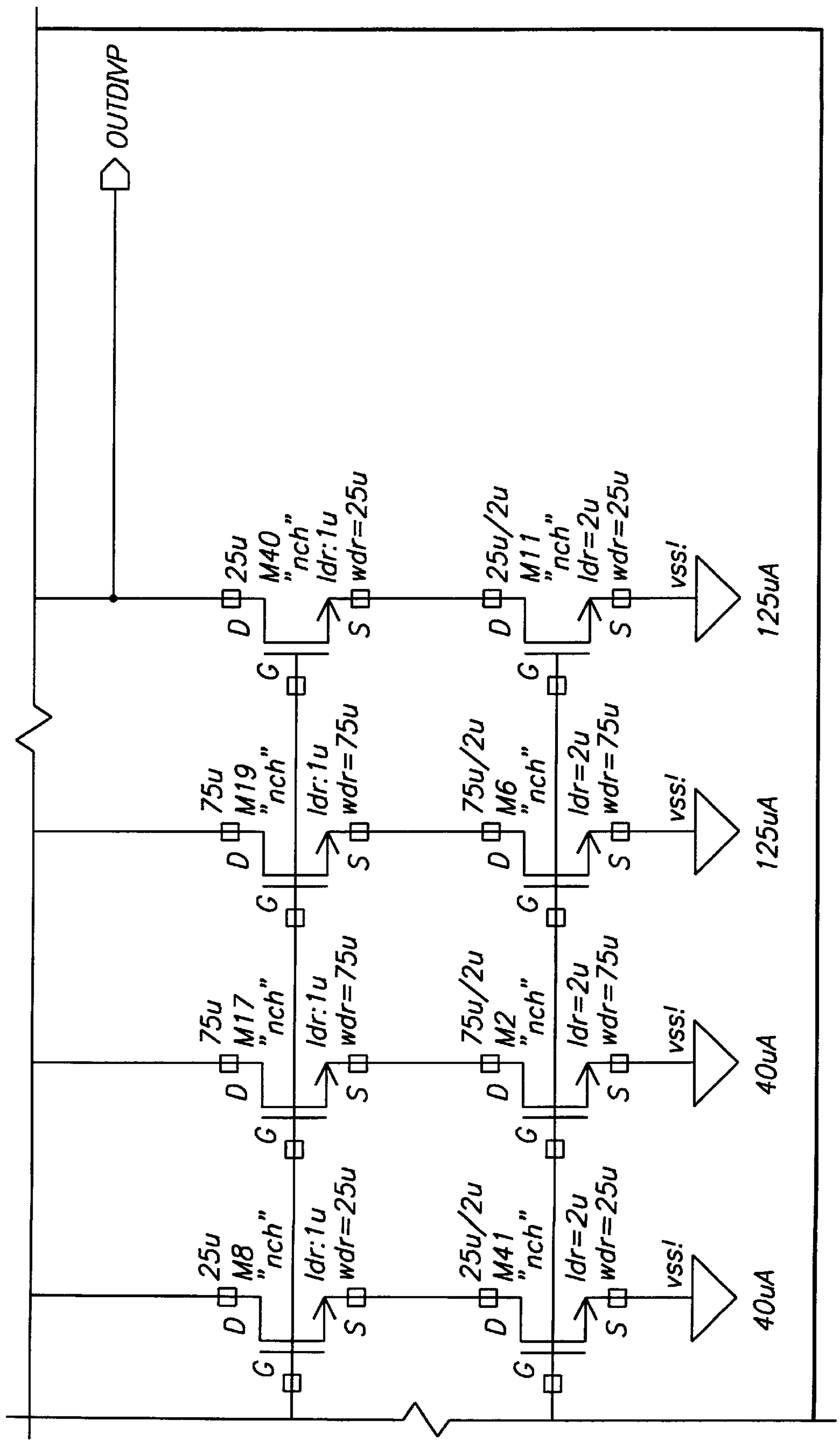
Fig. 8.0101CB

| | | | | | | | |
|---|---|---|---|---|---|---|---|
| 9.01AA | 9.01AB | 9.01AC | 9.01AD | 9.01AE | 9.01AF | 9.01AG | 9.01AH |
| 9.01BA | 9.01BB | 9.01BC | 9.01BD | 9.01BE | 9.01BF | 9.01BG | 9.01BH |
| 9.01CA | 9.01CB | 9.01CC | 9.01CD | 9.01CE | 9.01CF | 9.01CG | 9.01CH |
| 9.01DA | 9.01DB | 9.01DC | 9.01DD | 9.01DE | 9.01DF | 9.01DG | 9.01DH |

Fig. 9.01

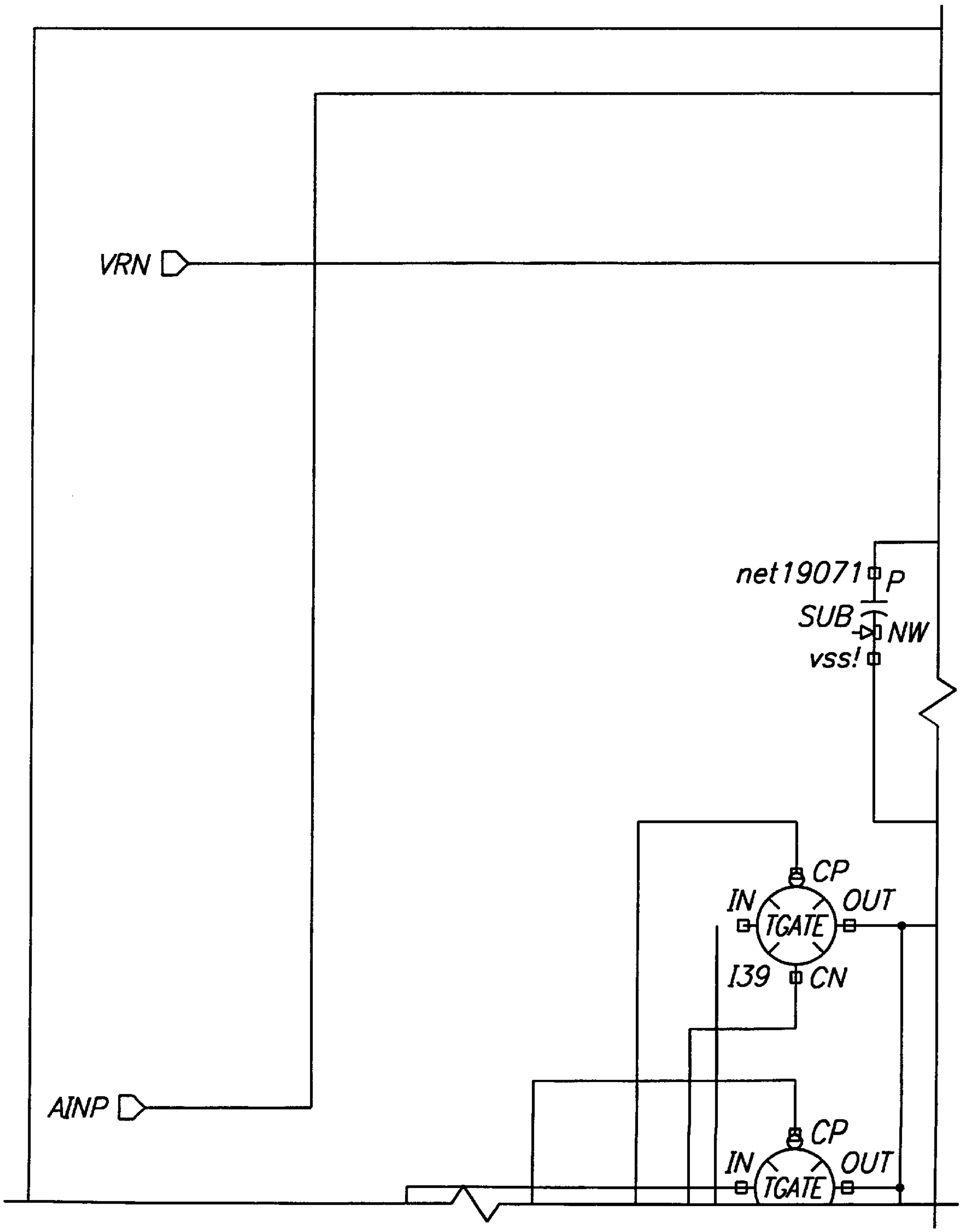
FIG 9.01AA

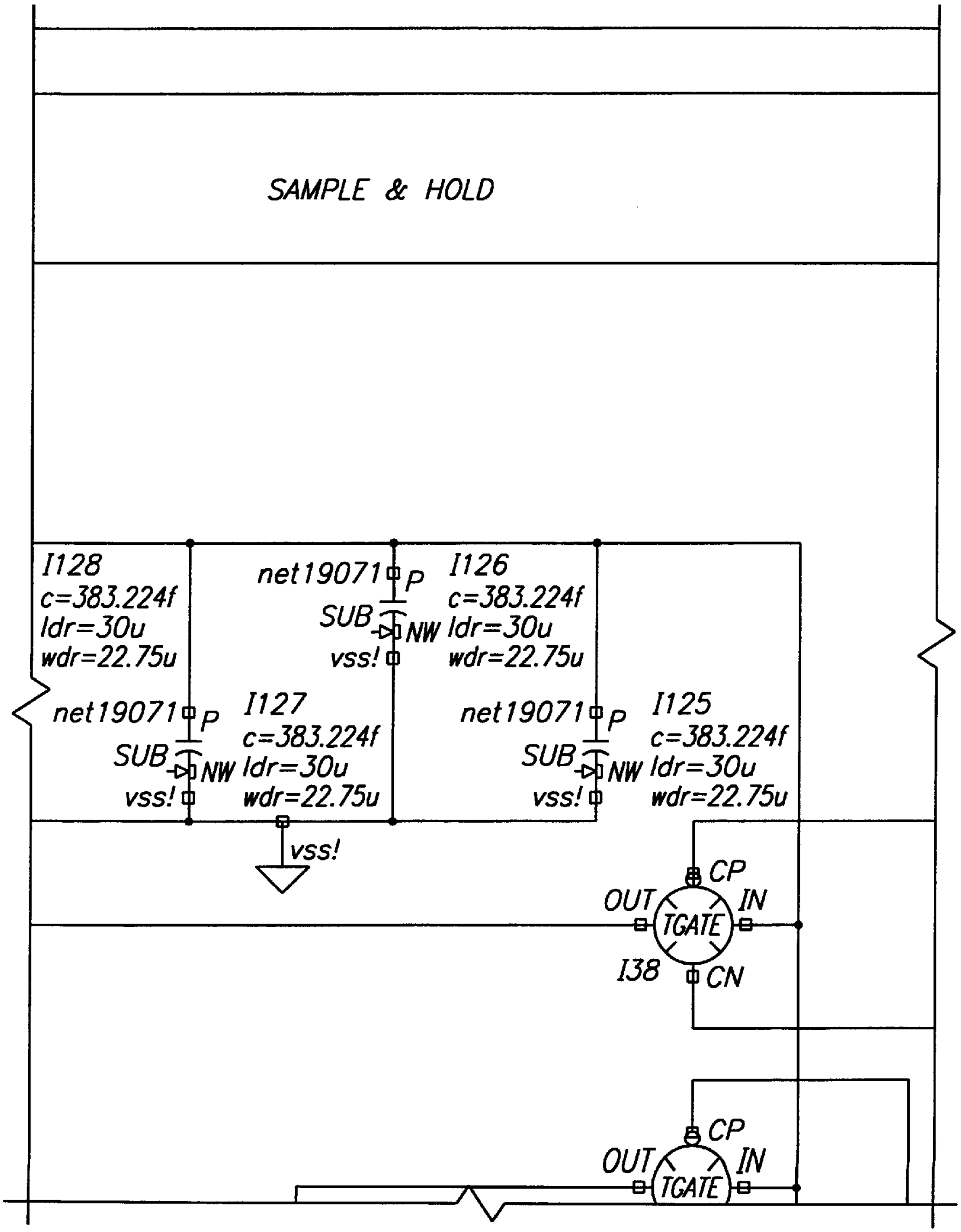
Fig 9.01AB

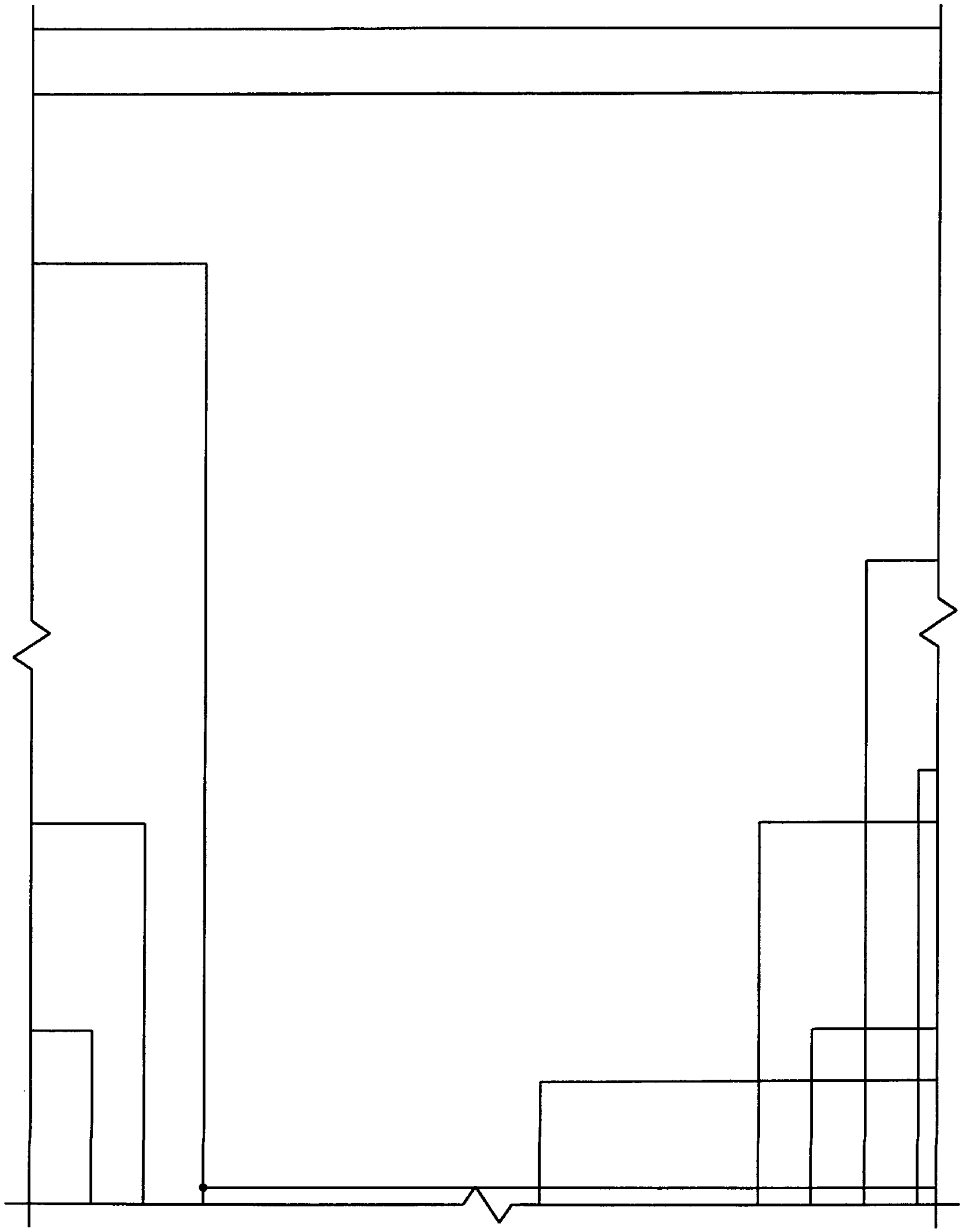
Fig 9.01AC

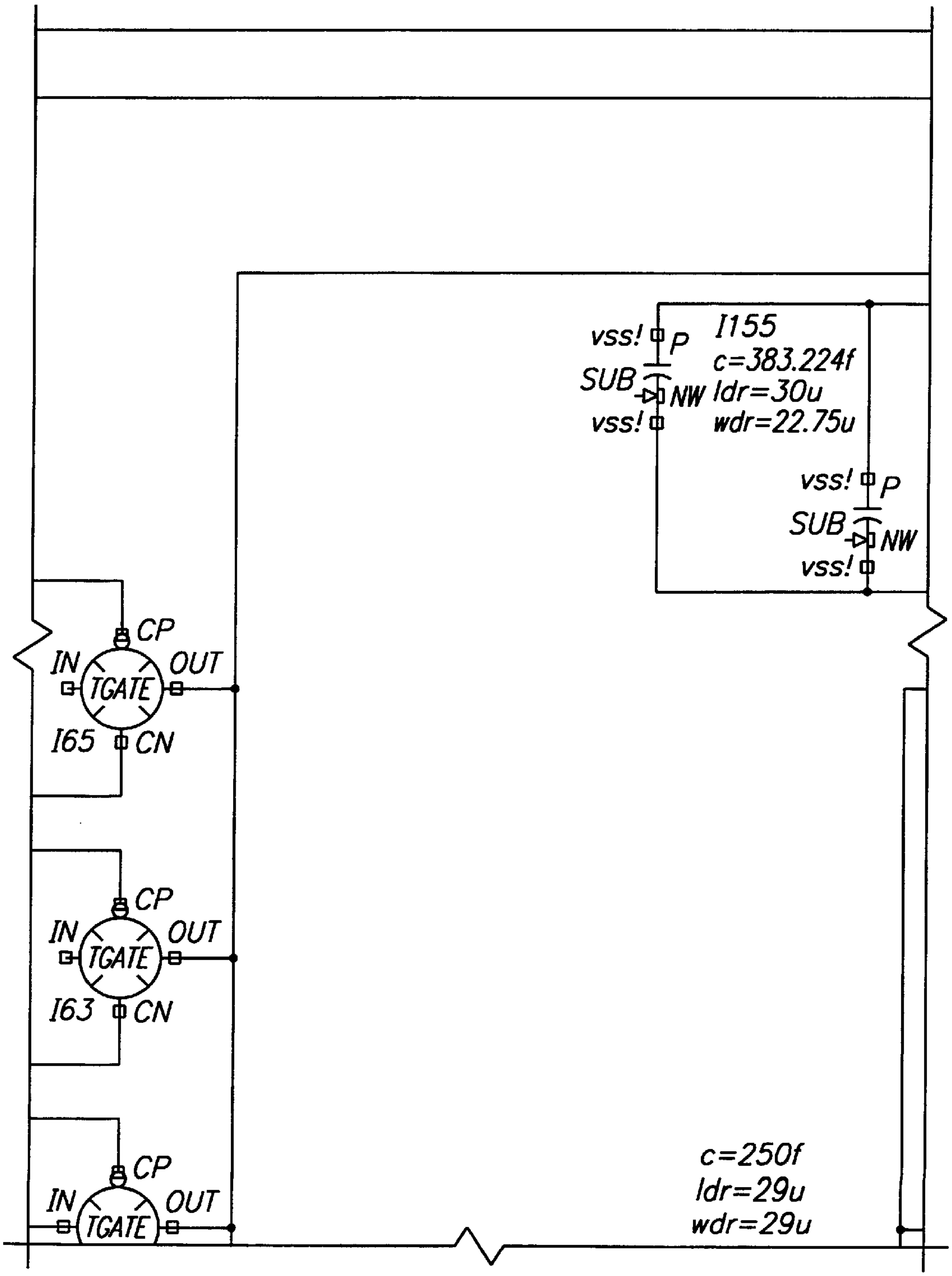
FIG 9.01AD

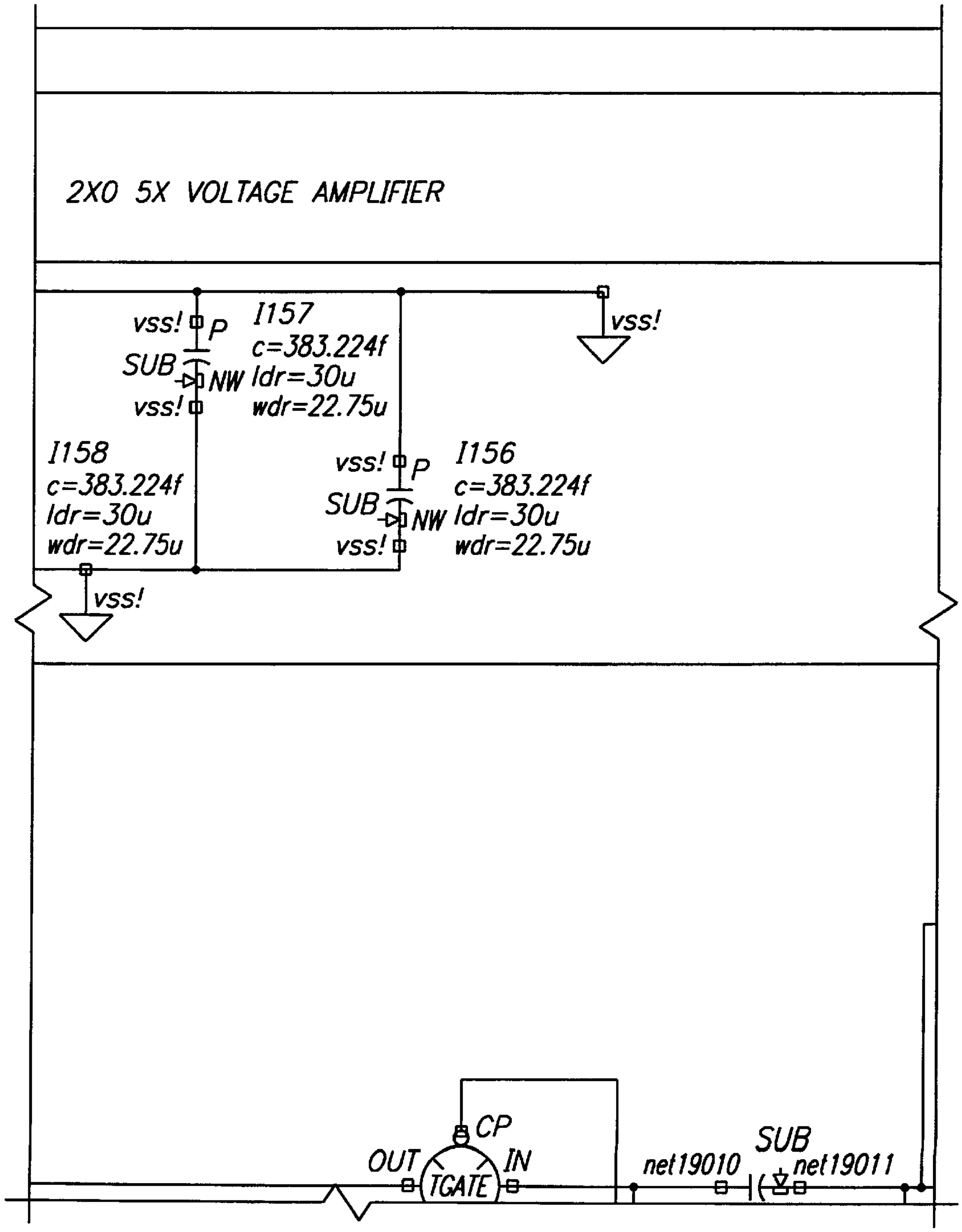
Fig 9.01AE

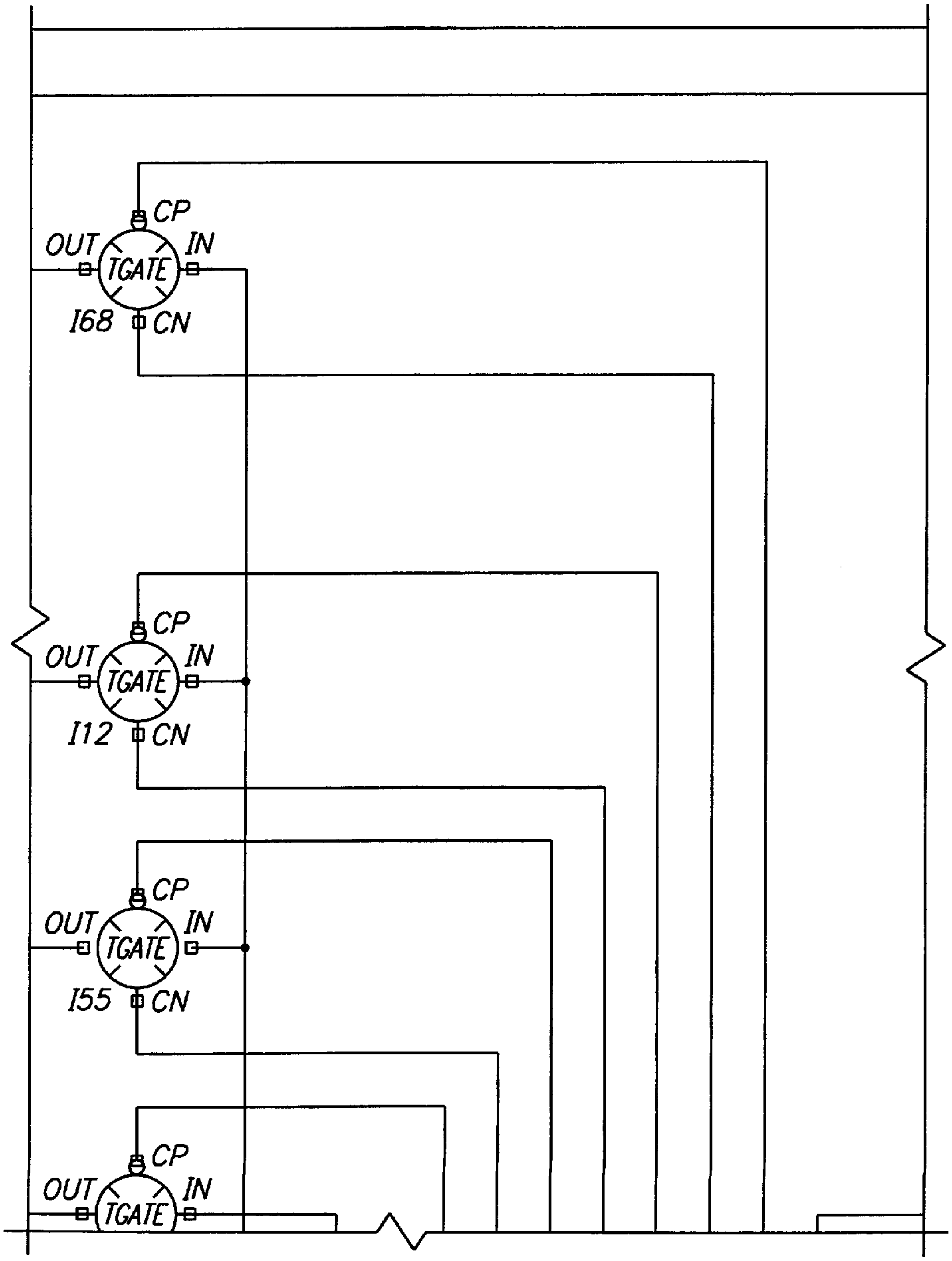
FIG 9.01AF

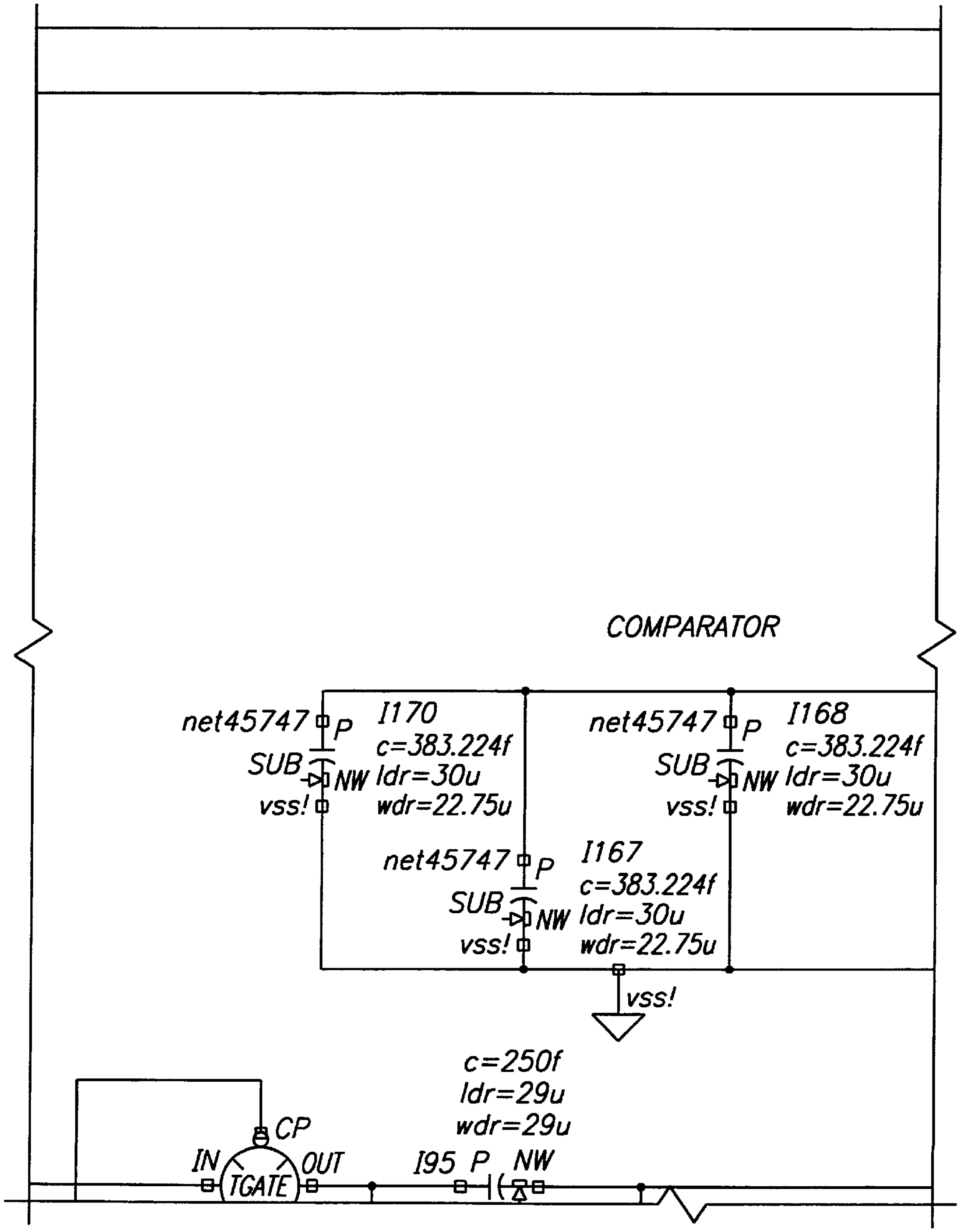
Fig 9.01AG

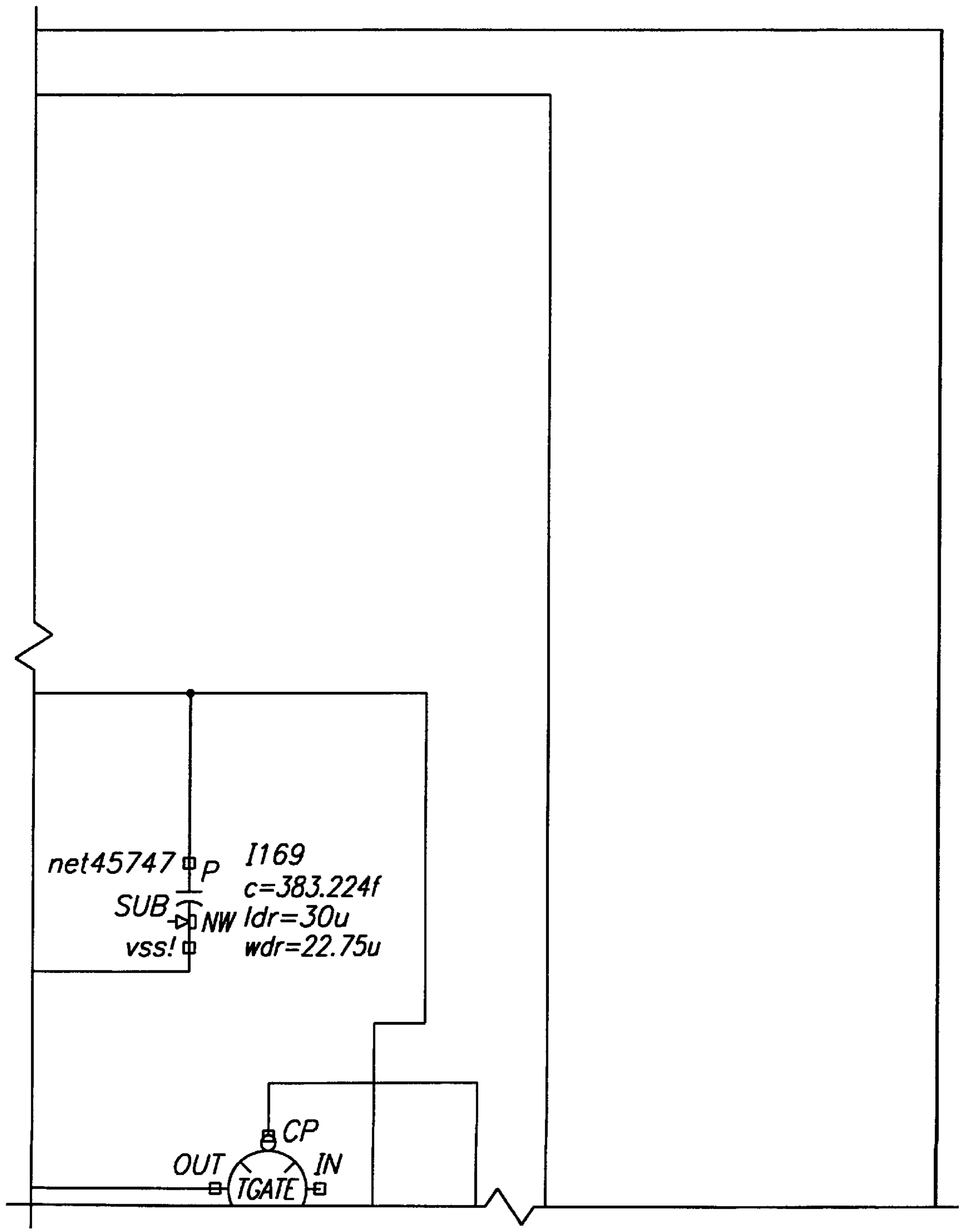
FIG 9.01AH

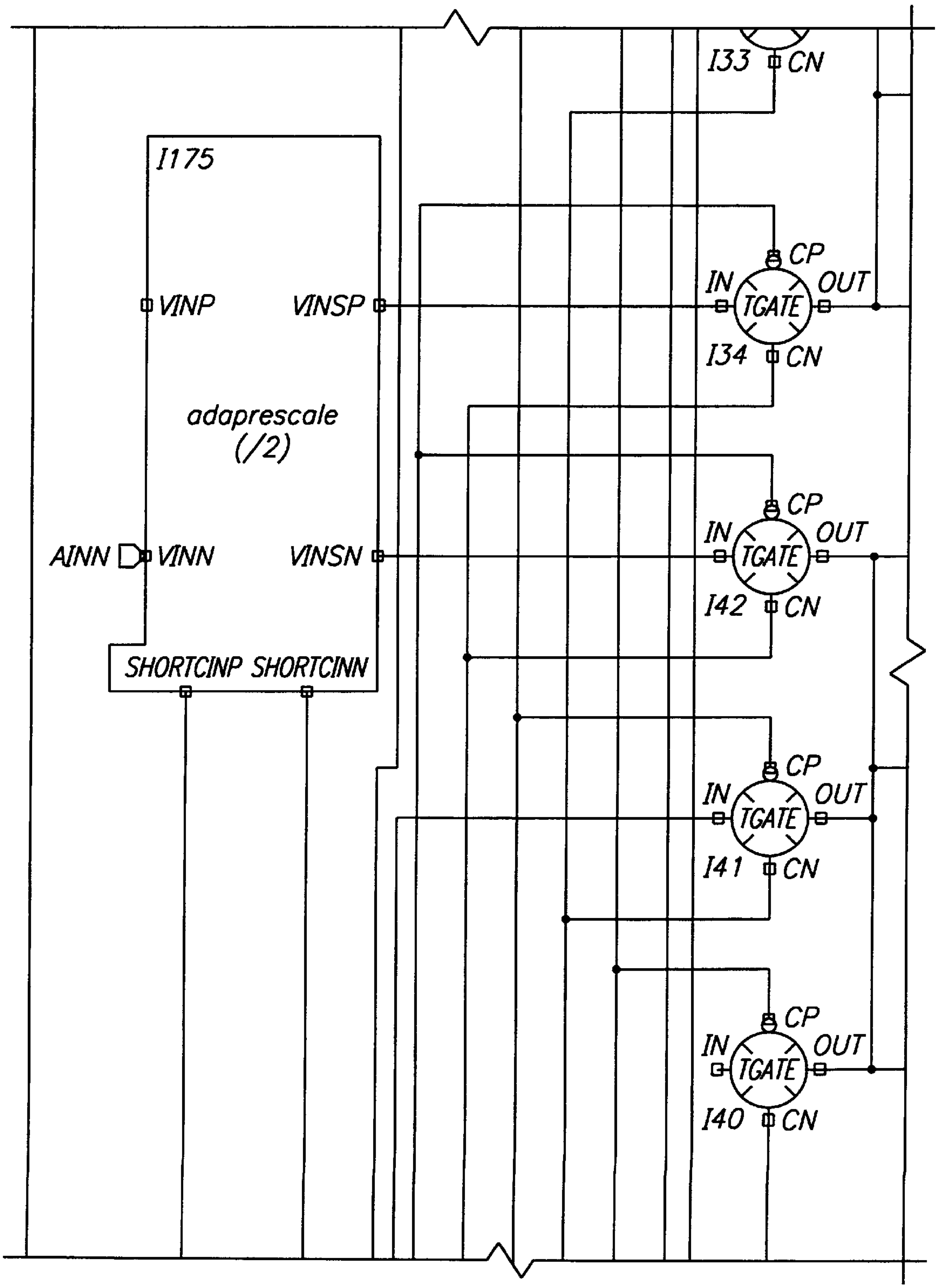
Fig. 9.01BA

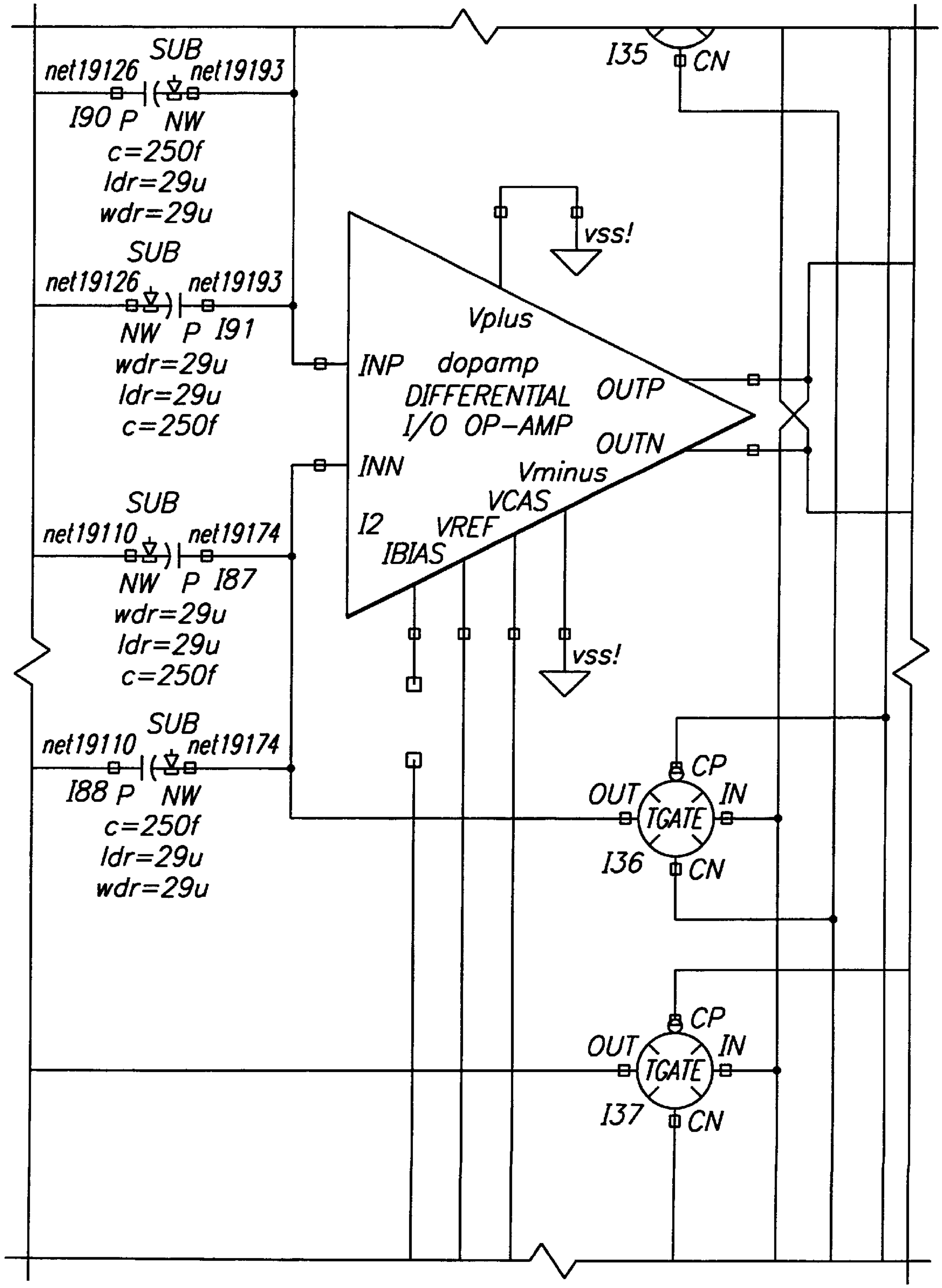
Fig 9.01BB

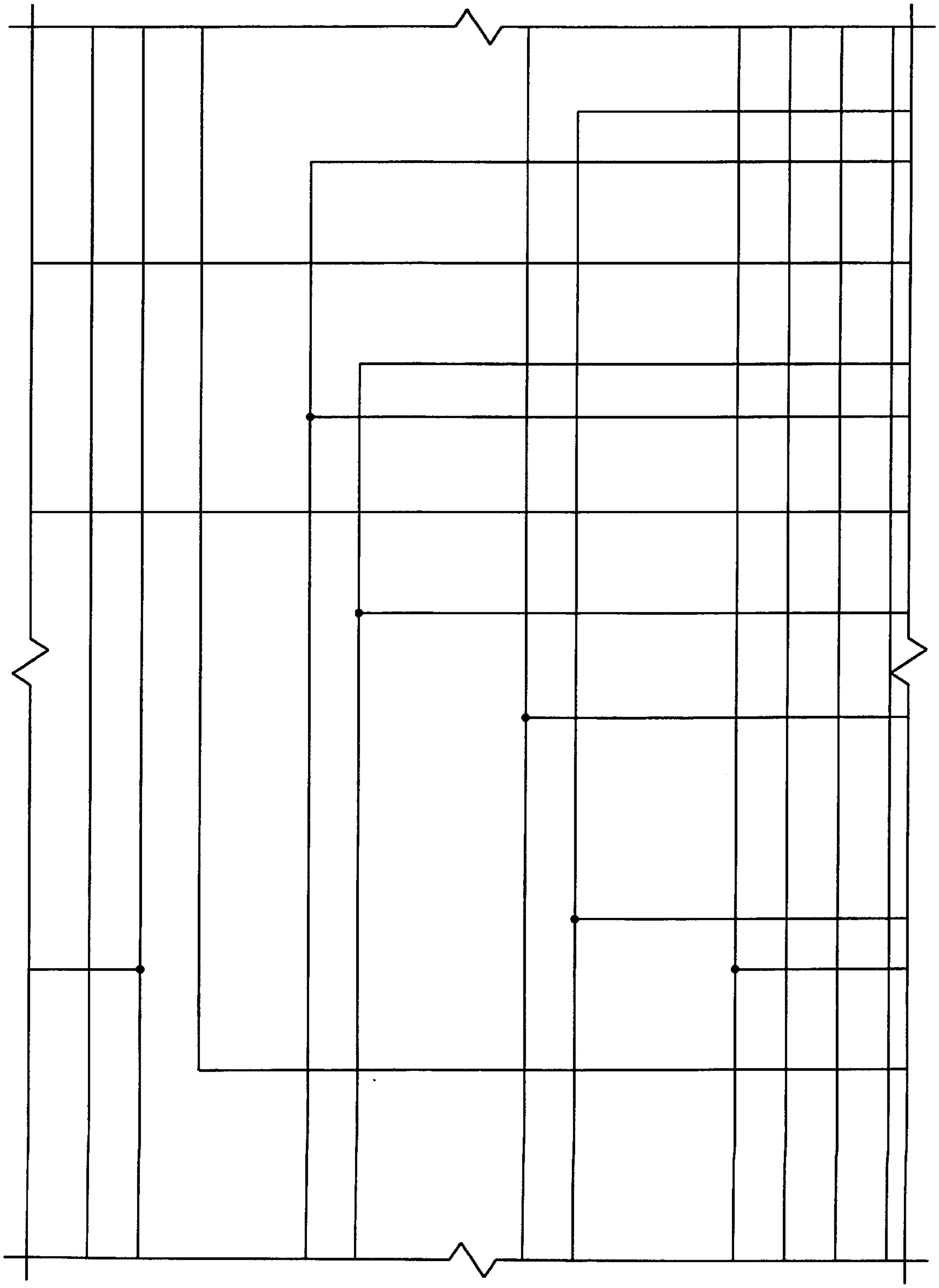
Fig 9.01BC

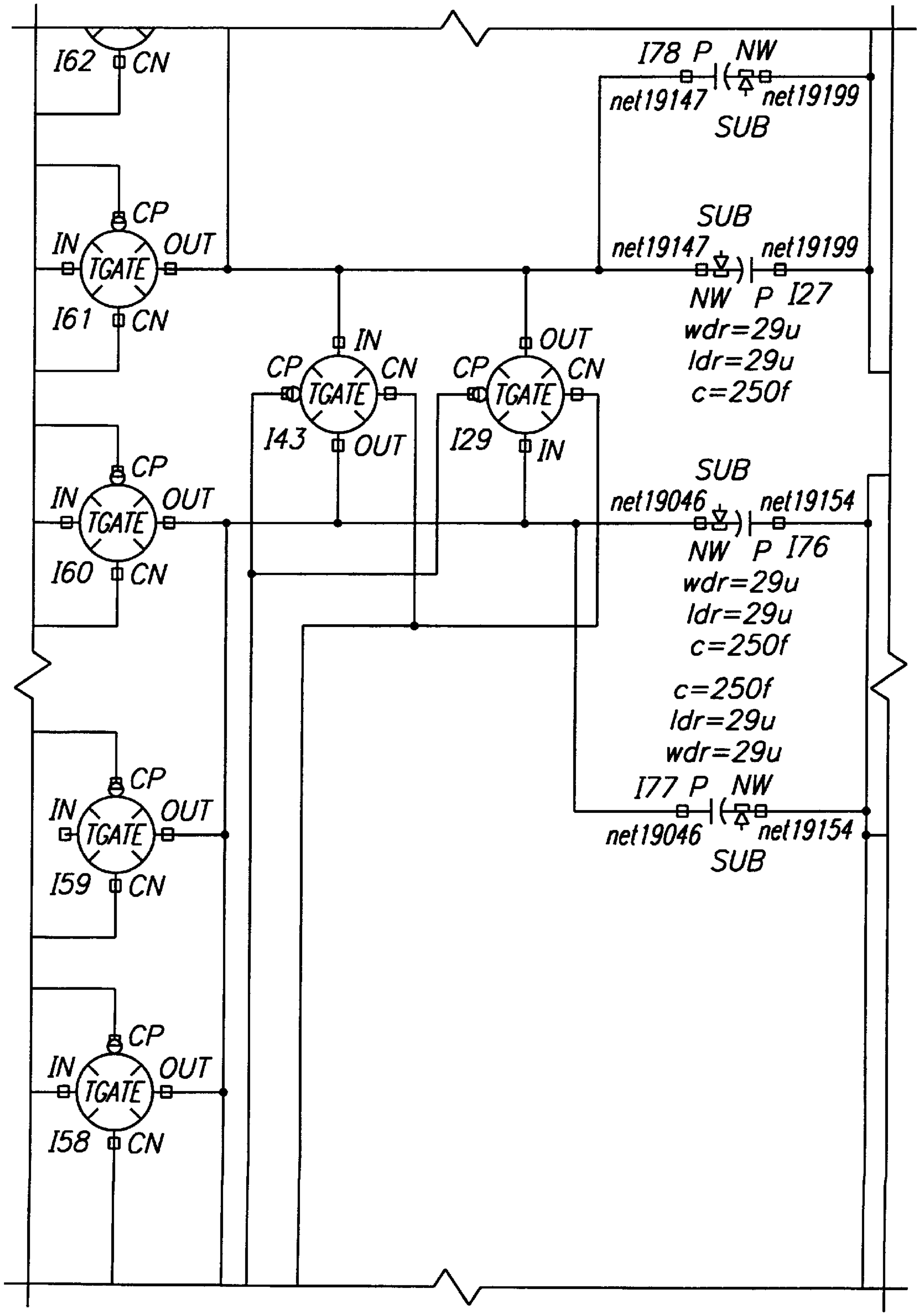
FIG. 9.01BD

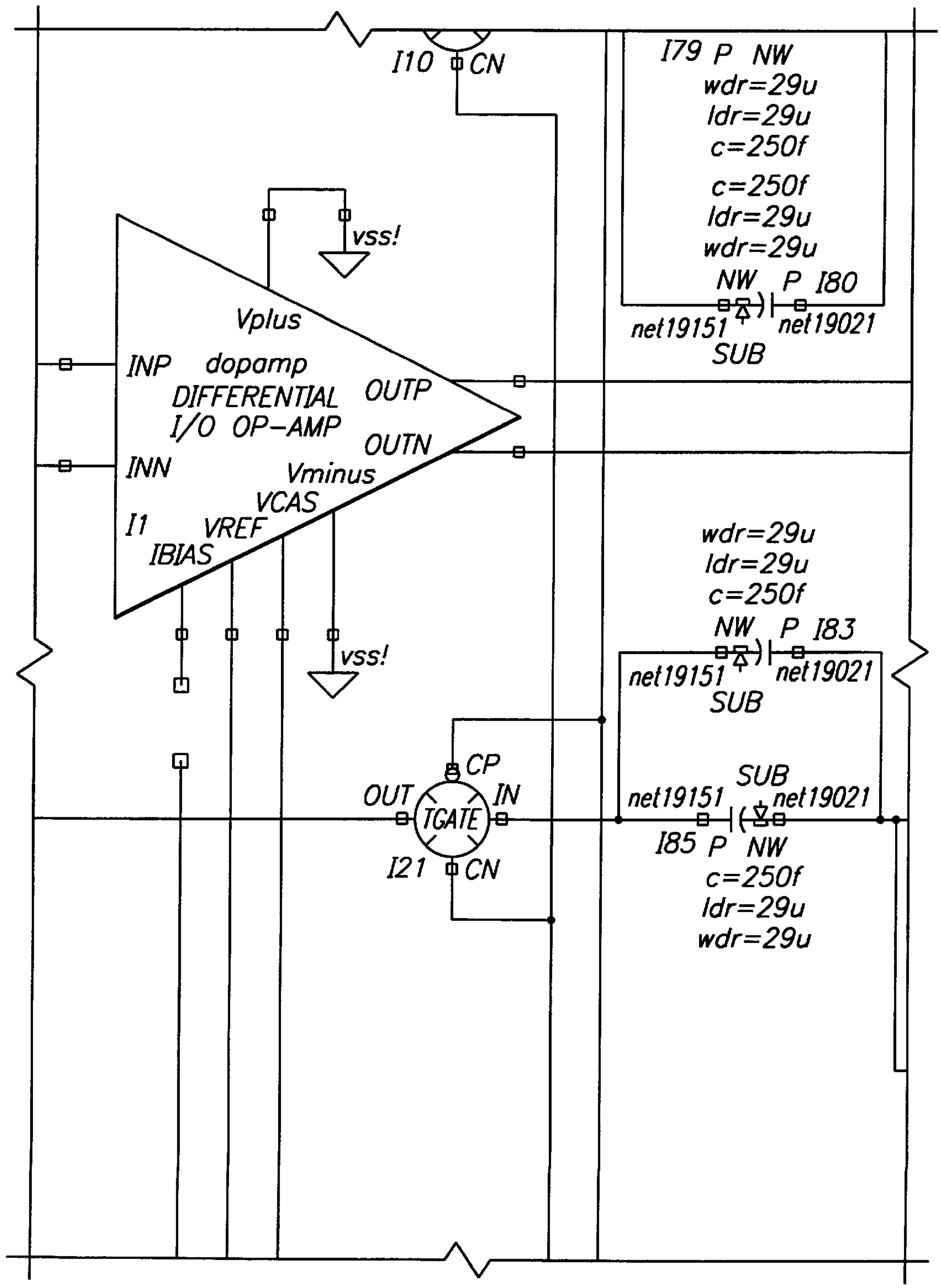
Fig 9.01BE

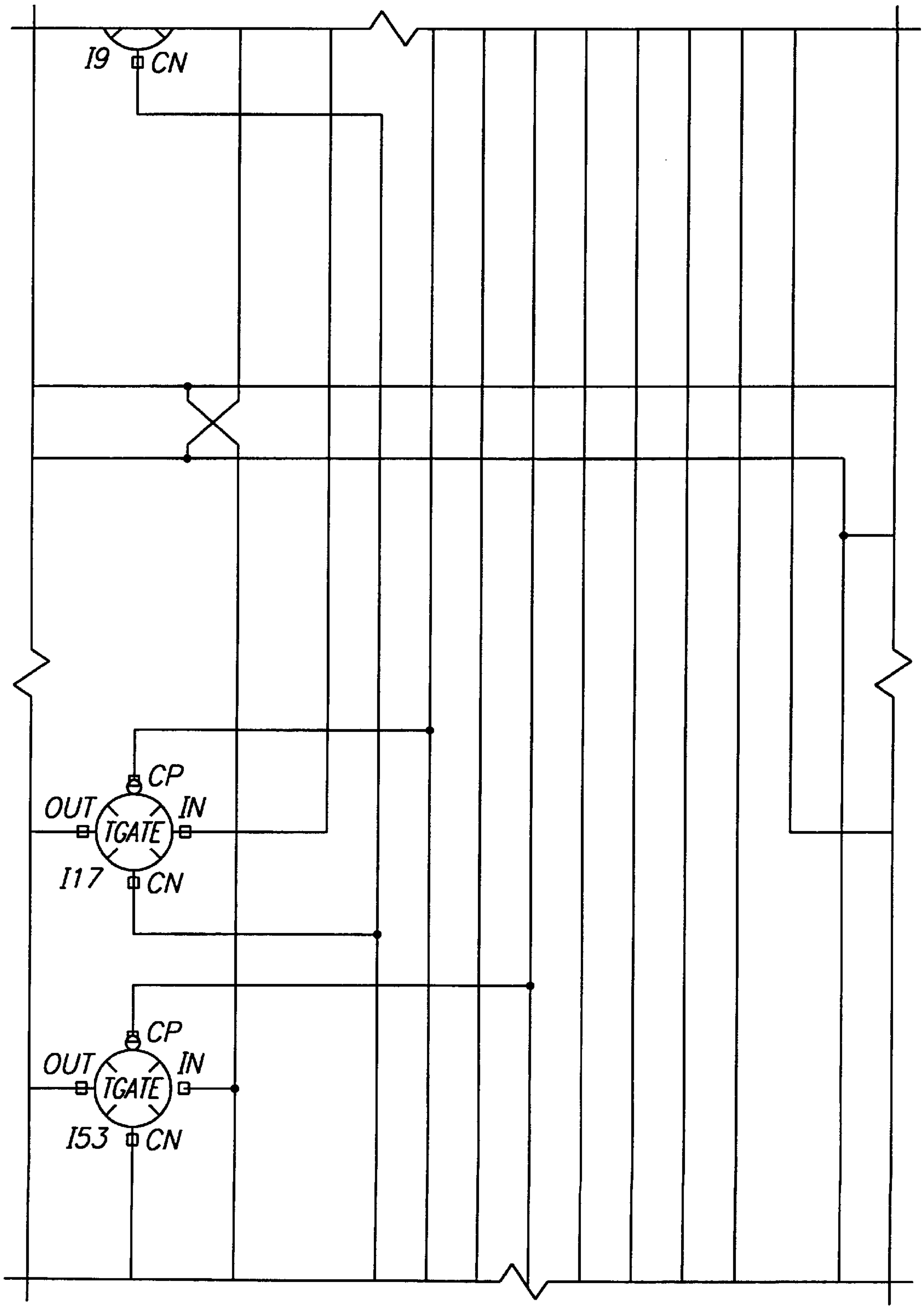
Fig 9.01BF

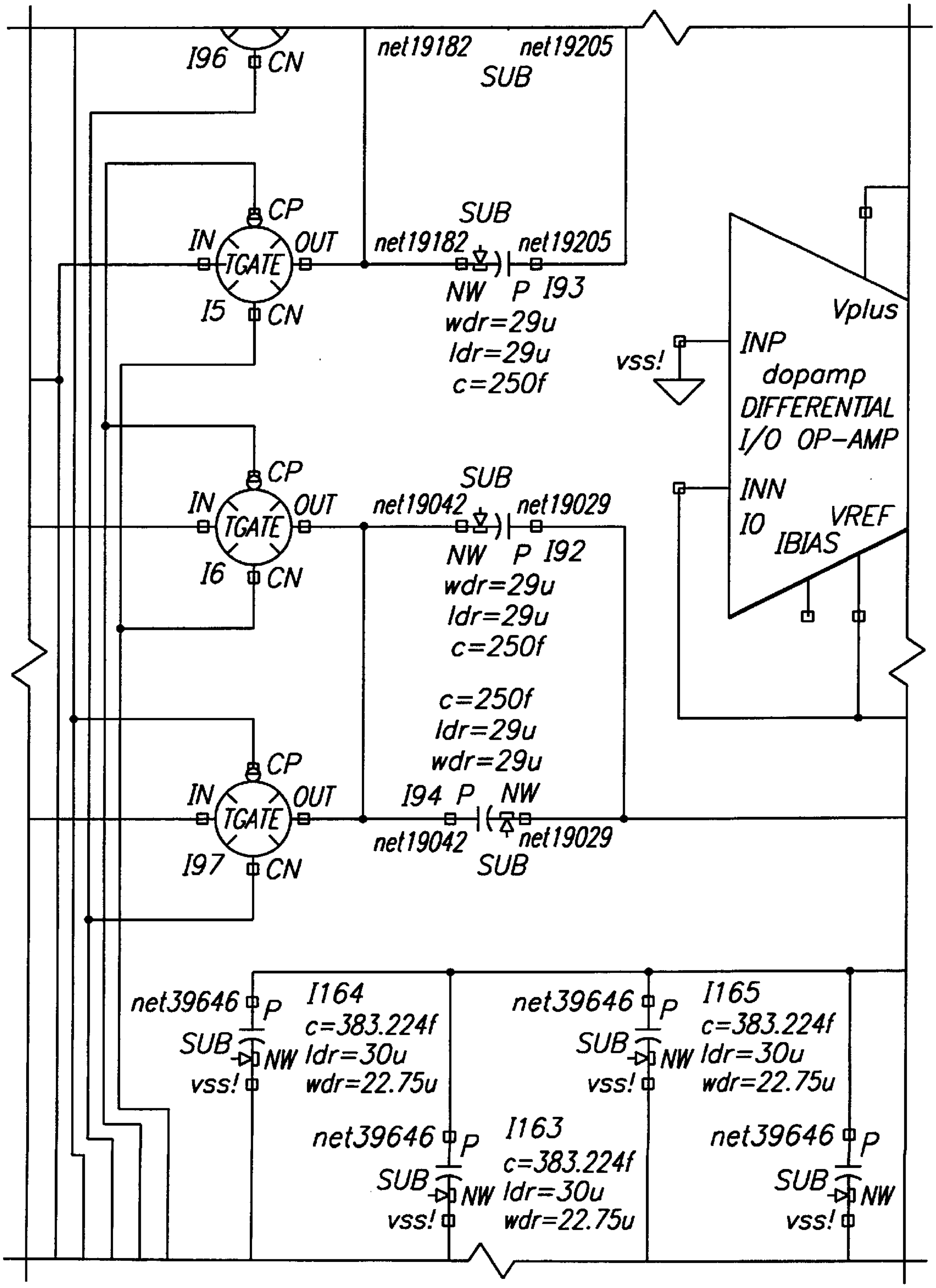
Fig 9.01BG

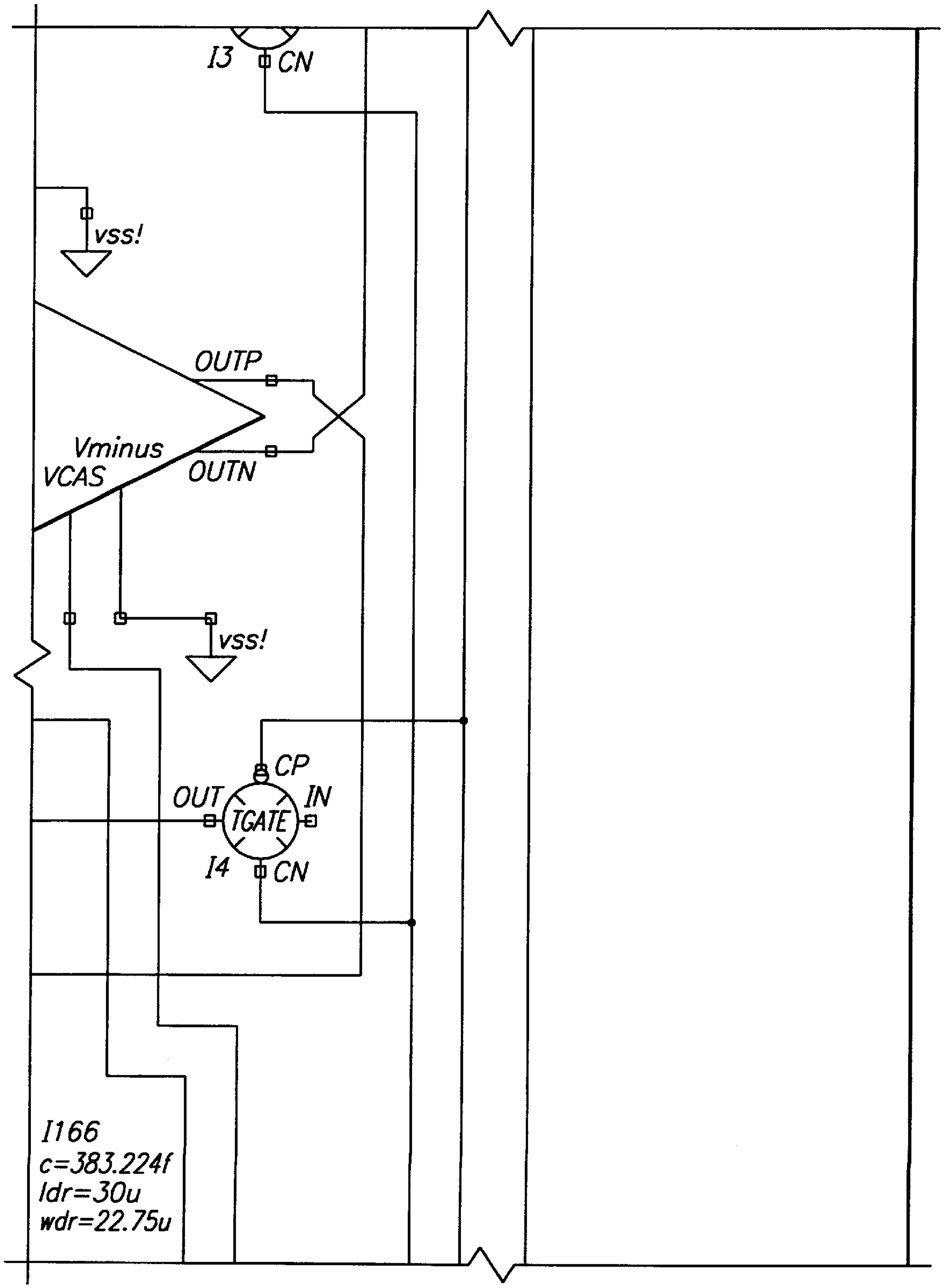
FIG 9.01BH

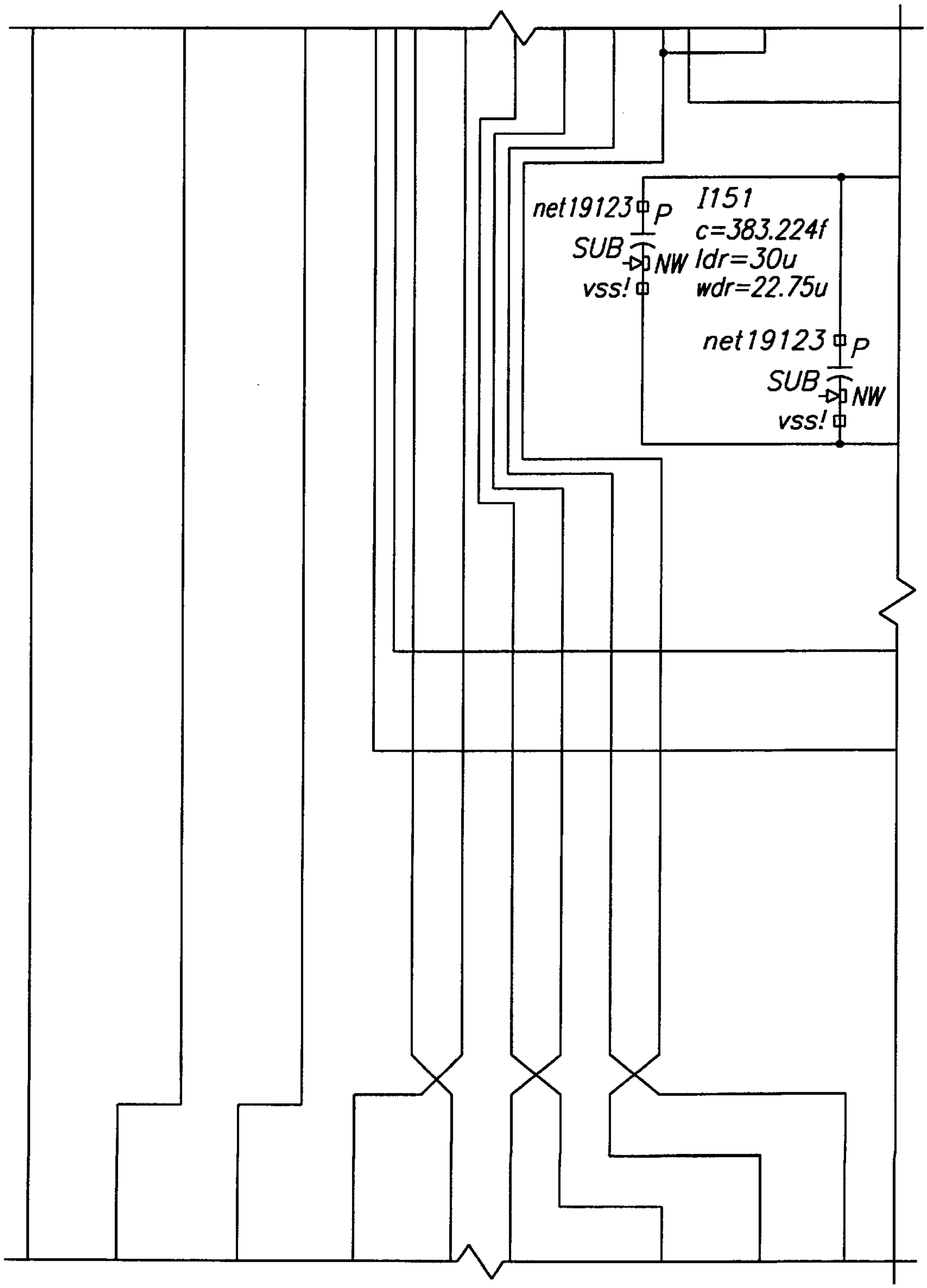
FIG 9.01CA

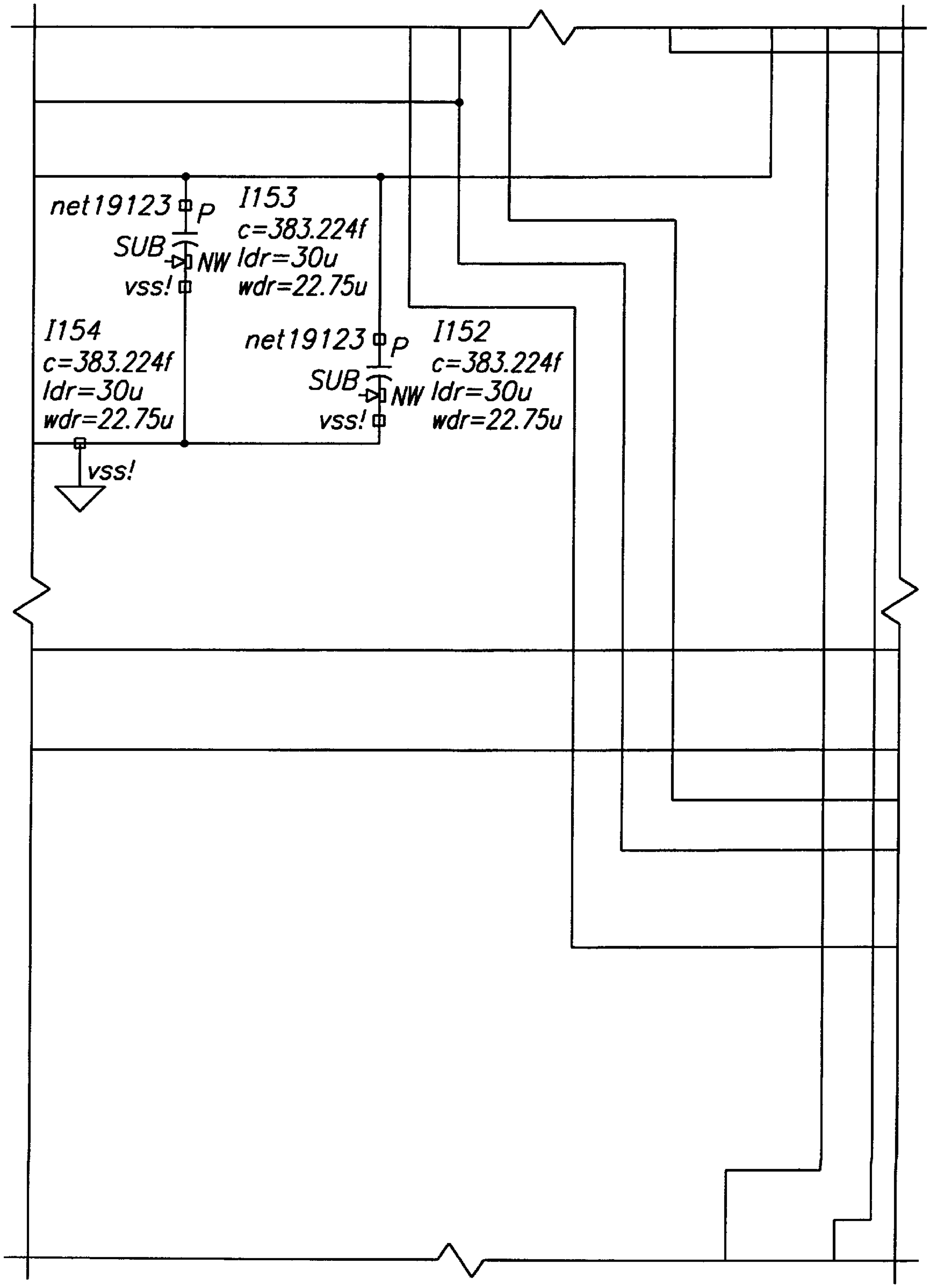
Fig 9.01CB

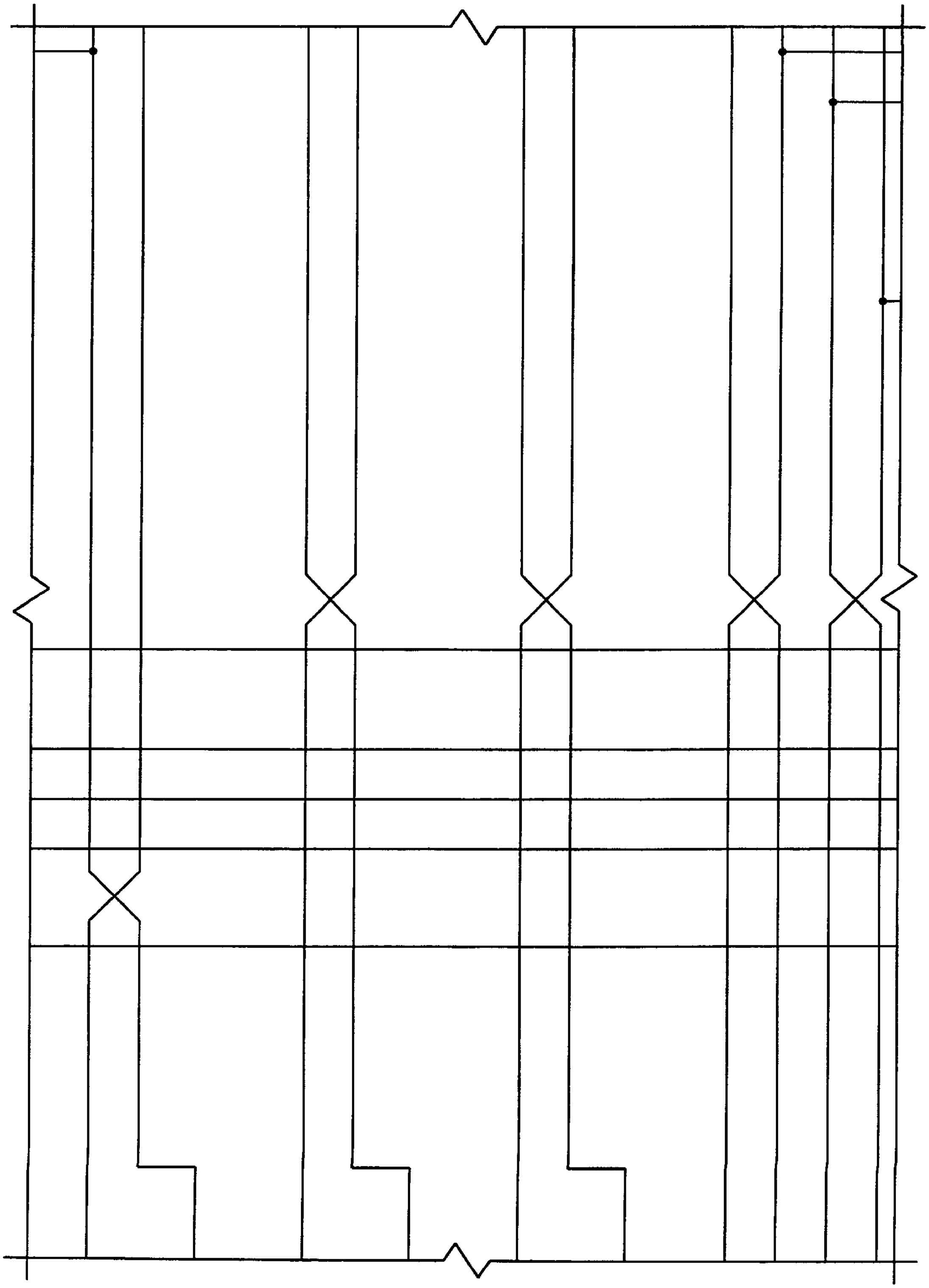
Fig 9.01CC

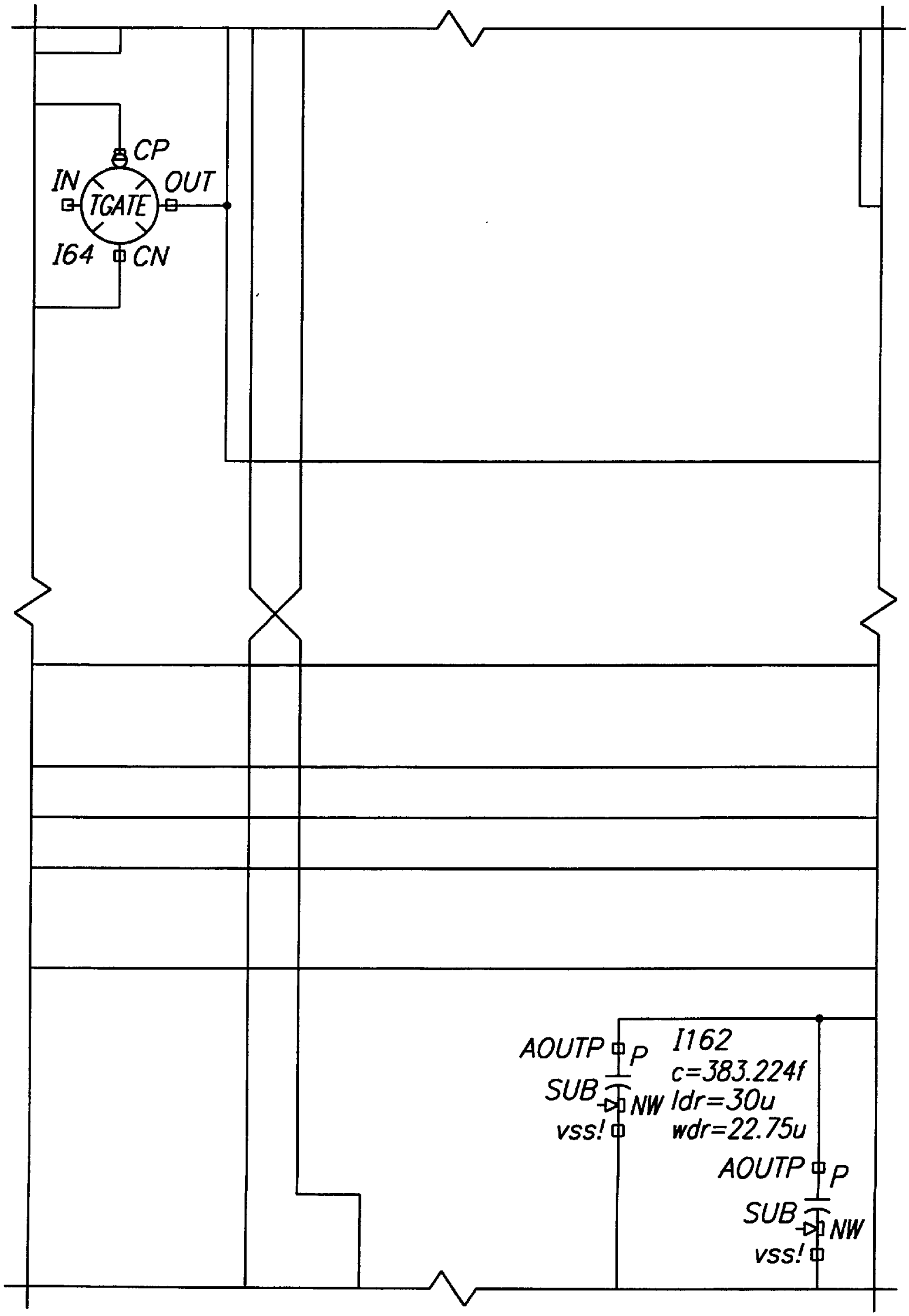
Fig 9.01CD

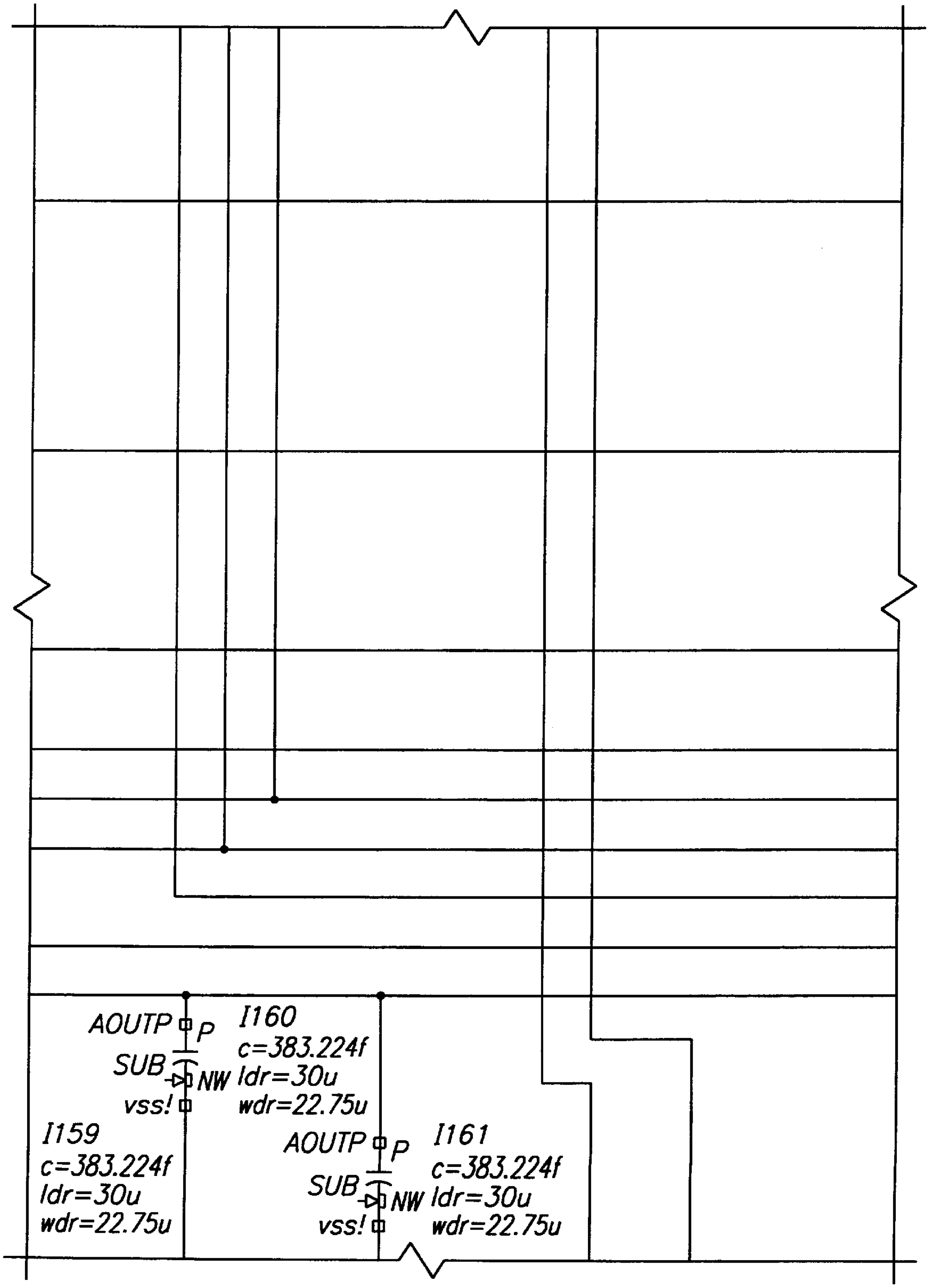
Fig 9.DICE

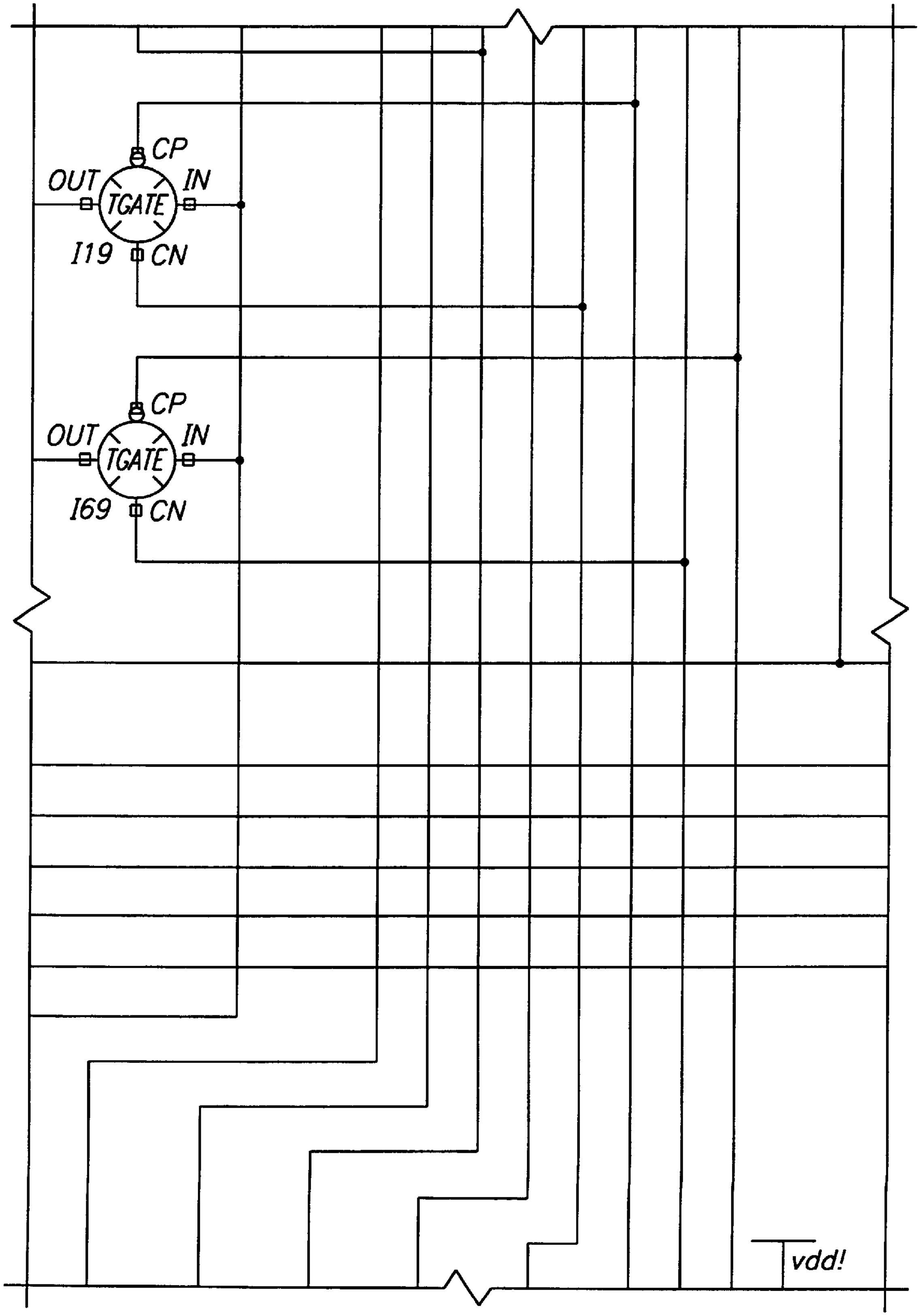
FIG 9.01CF

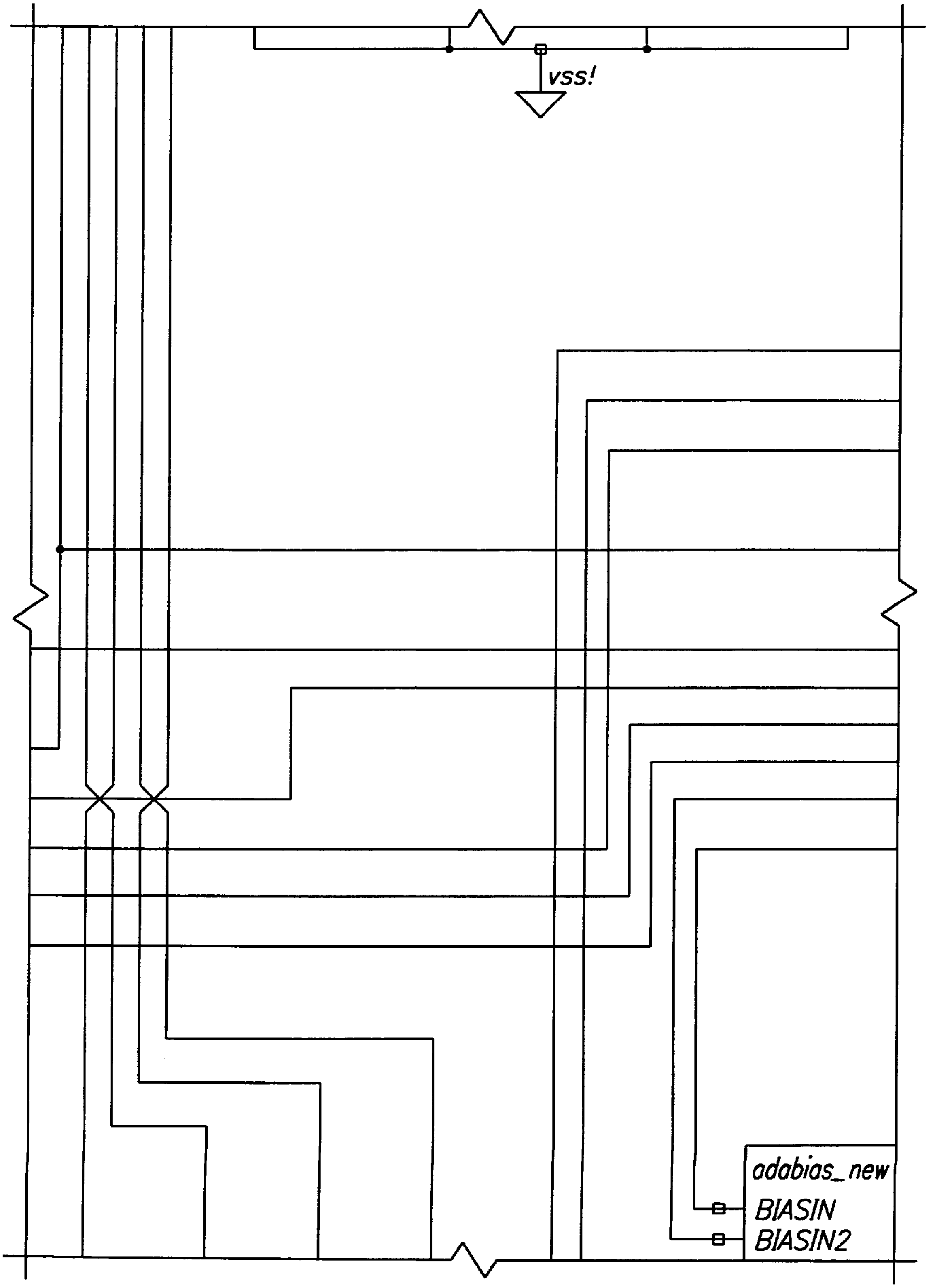
Fig 9.01CG

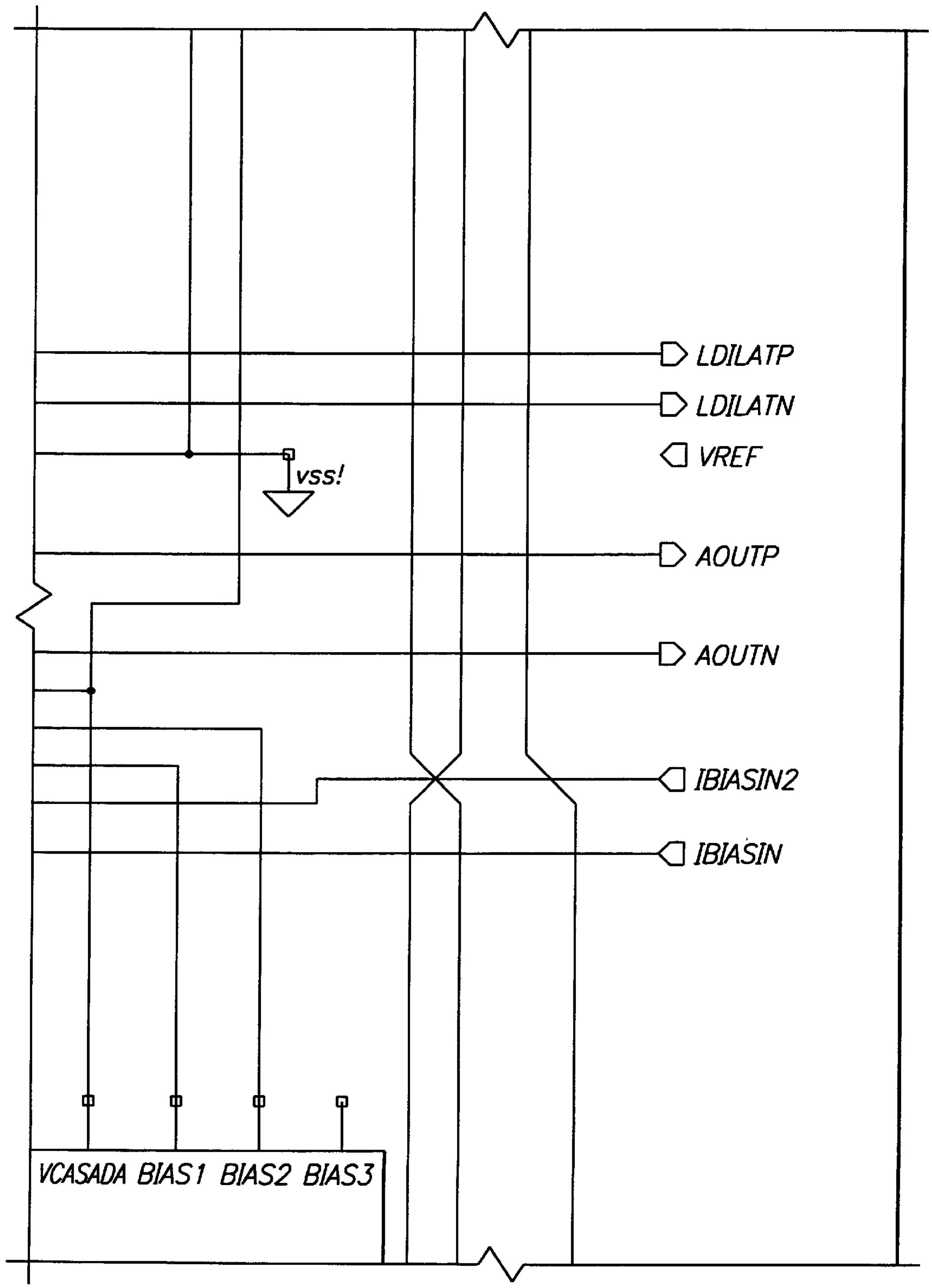
Fig 9.01CH

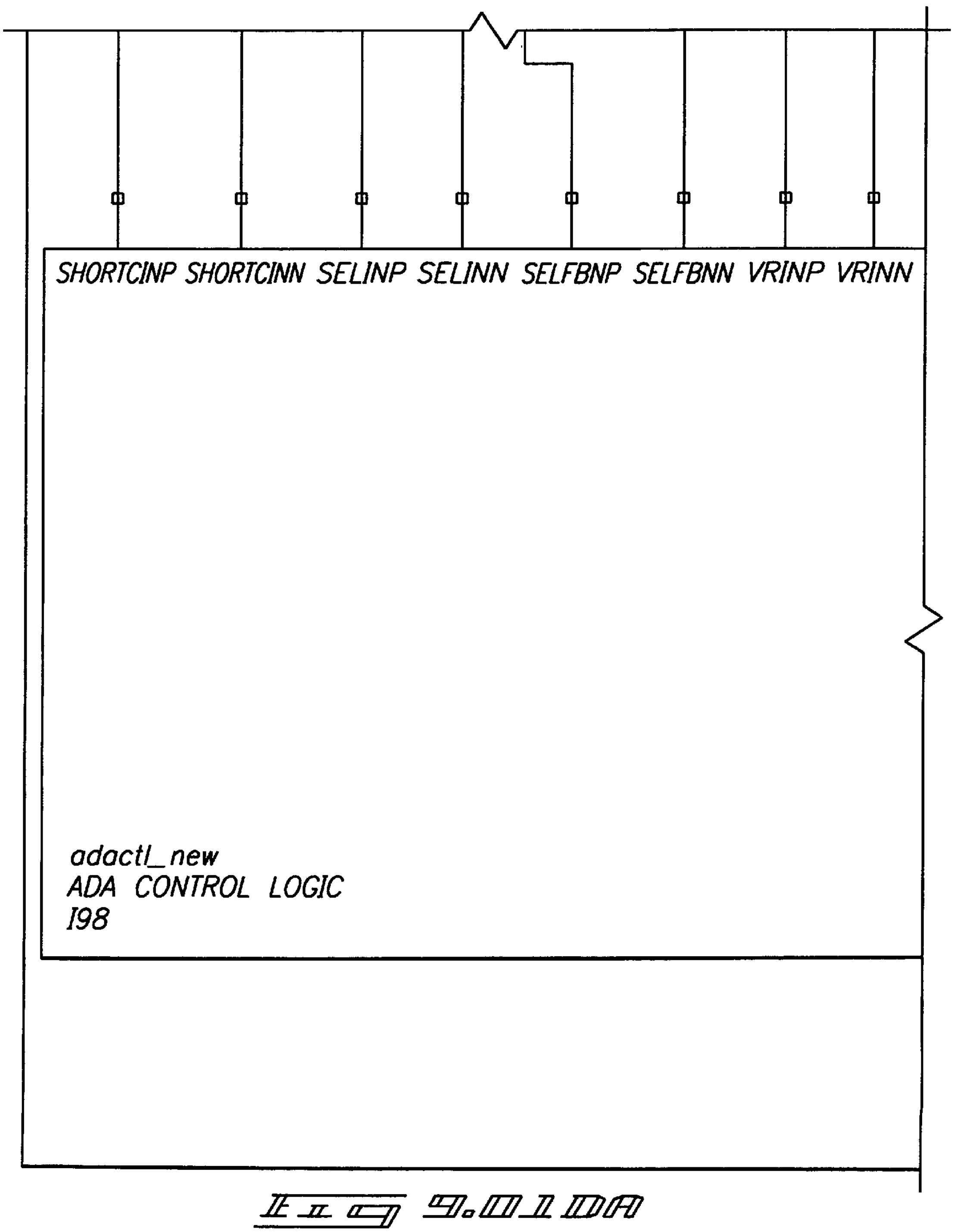
Fig 9.01DA

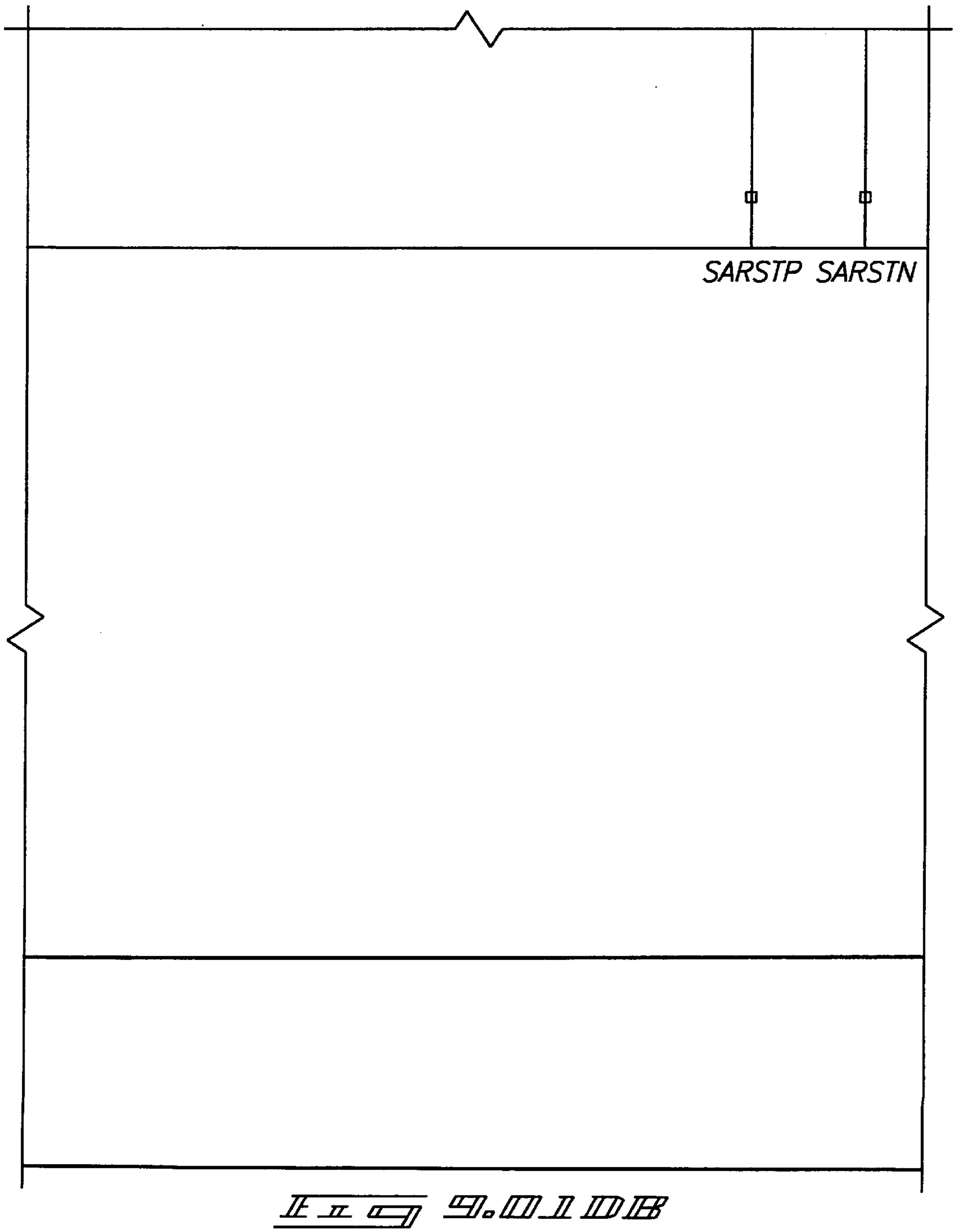
Fig 9.01DB

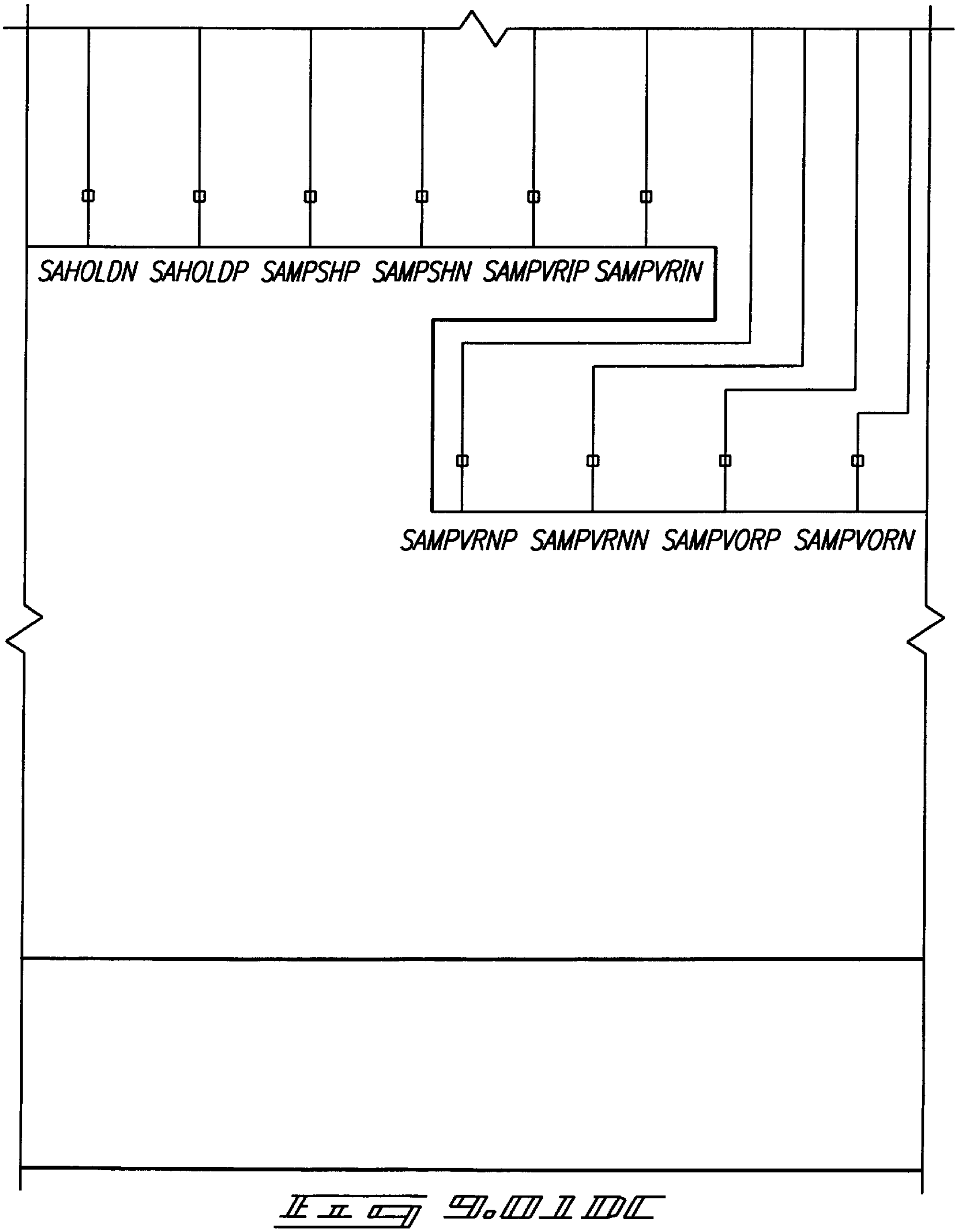
Fig 9.011DC

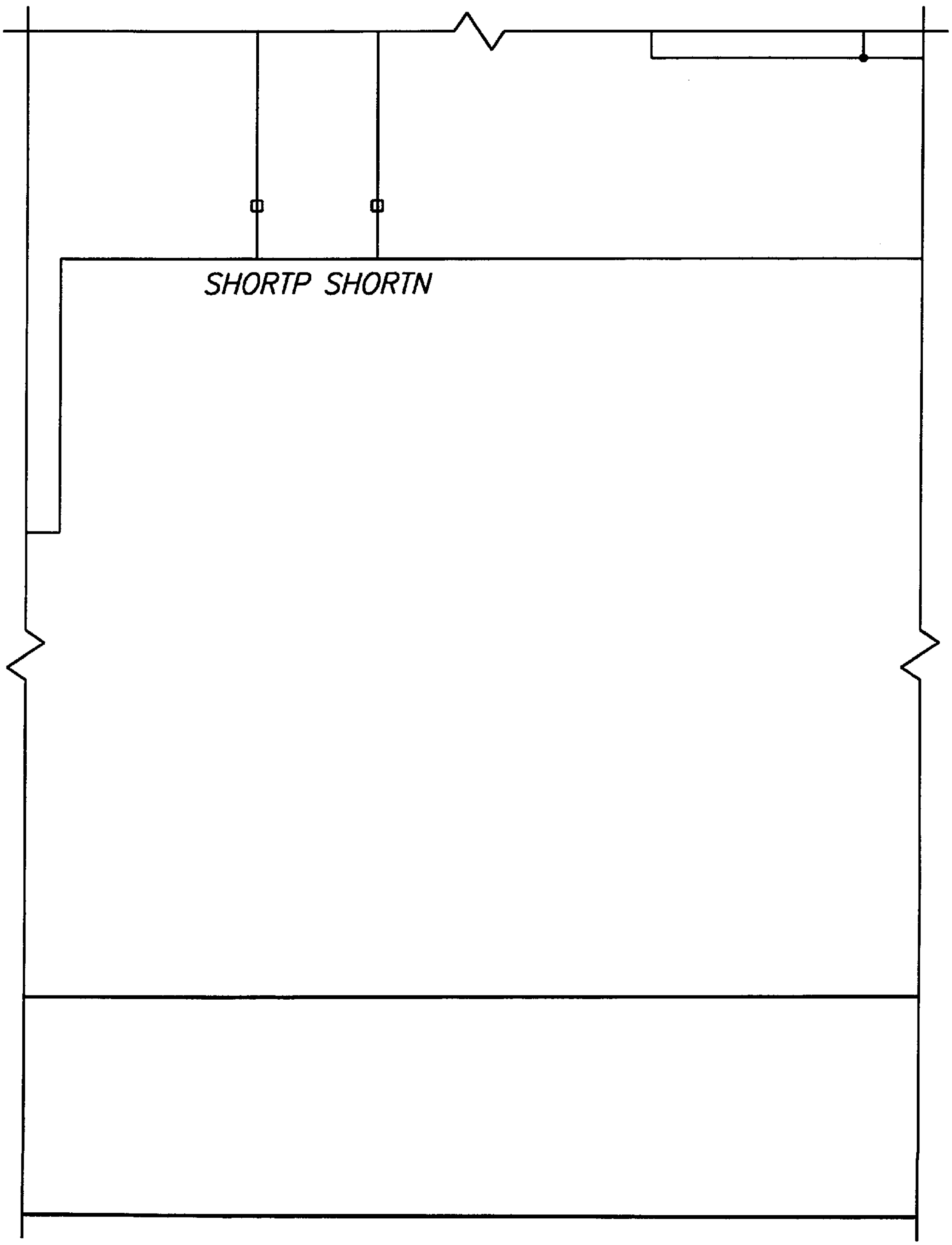
Fig 9.01DD

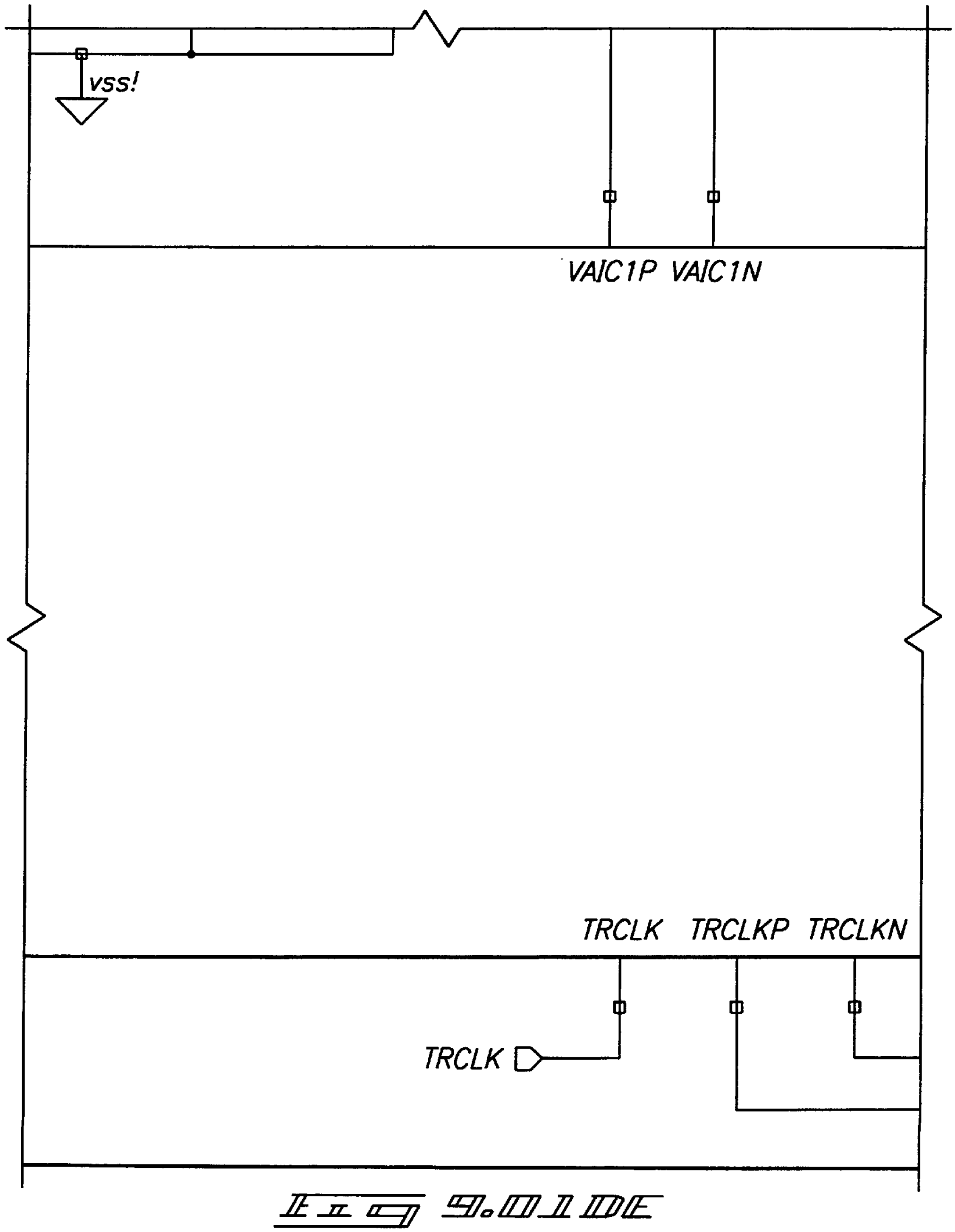
Fig 9.001DE

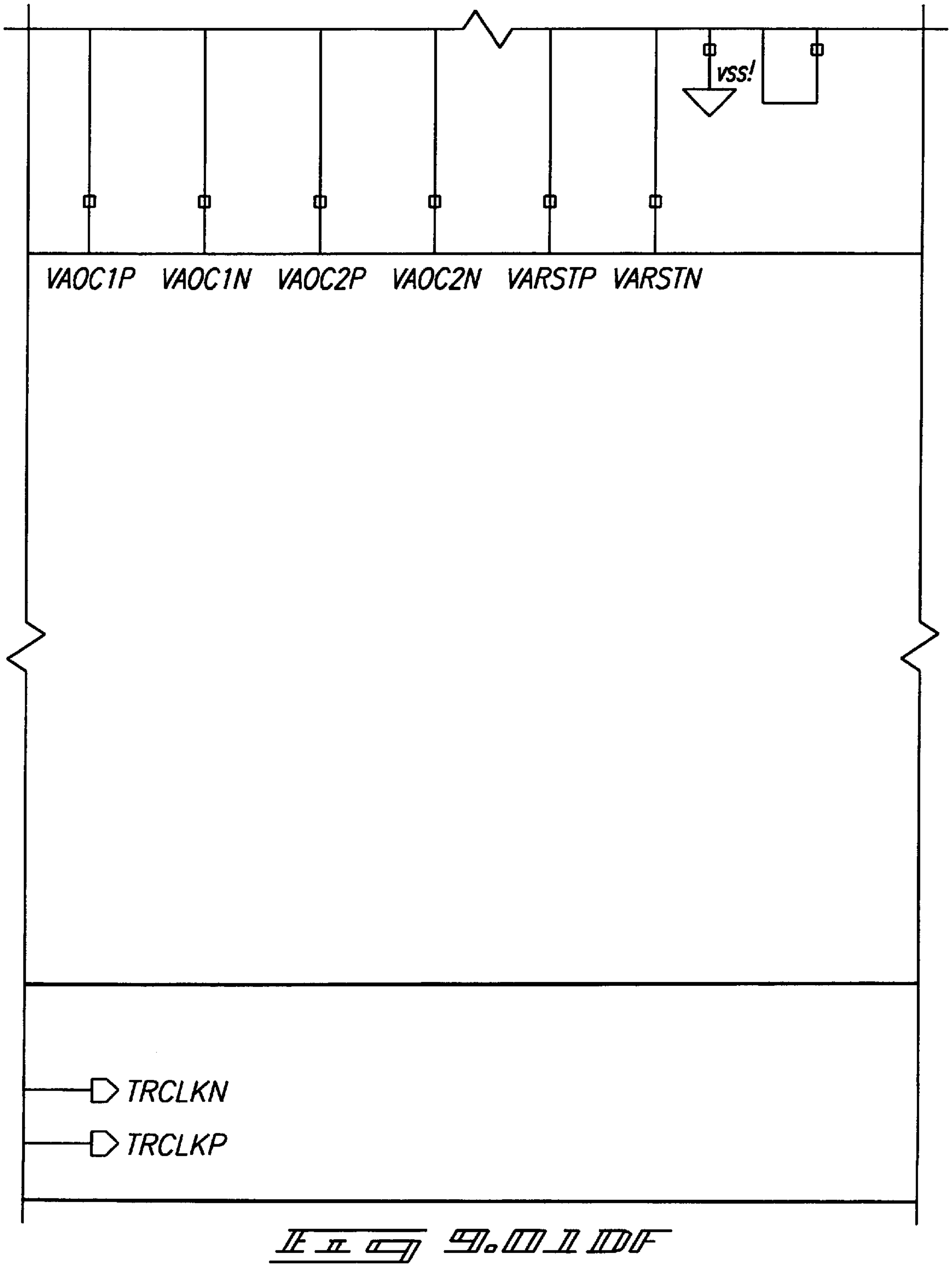
Fig 9.01DF

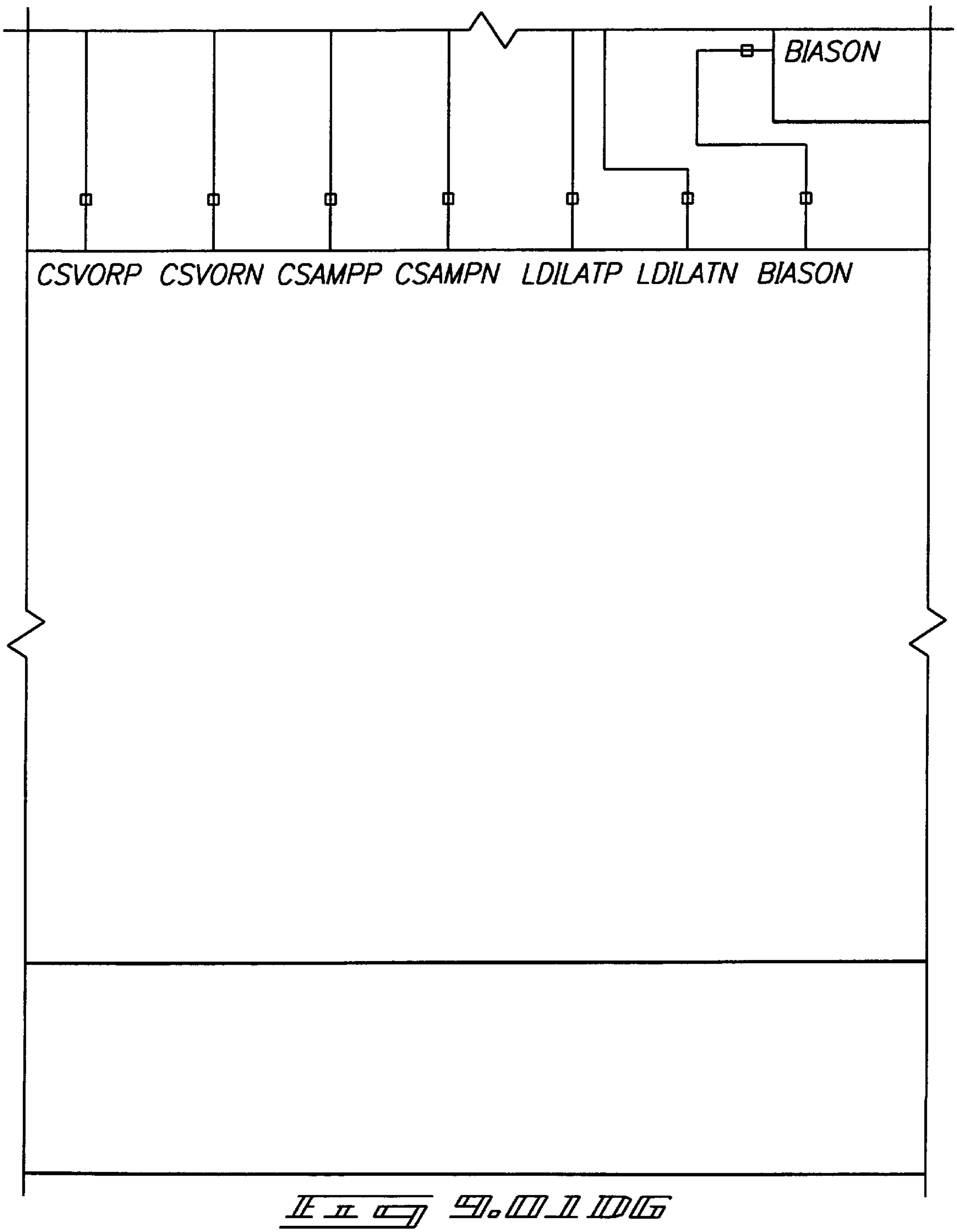
FIG. 9.01DG

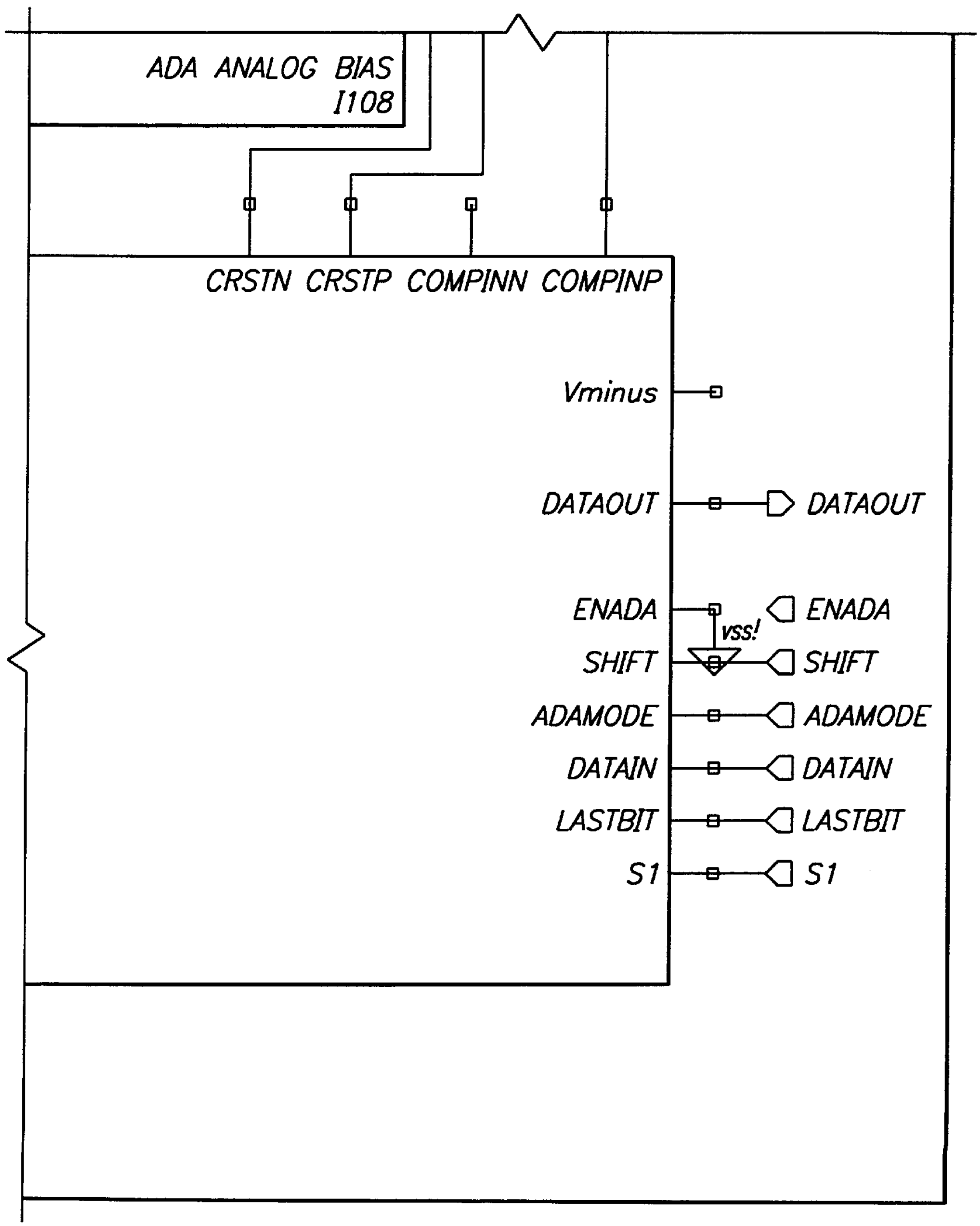
Fig 9.01DH

| | | | | | | | | | | |
|---|---|---|---|---|---|---|---|---|---|---|
| 9.0101AA | 9.0101AB | 9.0101AC | 9.0101AD | 9.0101AE | 9.0101AF | 9.0101AG | 9.0101AH | 9.0101AI | 9.0101AJ | 9.0101AK |
| 9.0101BA | 9.0101BB | 9.0101BC | 9.0101BD | 9.0101BE | 9.0101BF | 9.0101BG | 9.0101BH | 9.0101BI | 9.0101BJ | 9.0101BK |
| 9.0101CA | 9.0101CB | 9.0101CC | 9.0101CD | 9.0101CE | 9.0101CF | 9.0101CG | 9.0101CH | 9.0101CI | 9.0101CJ | 9.0101CK |

Fig. 9.0101

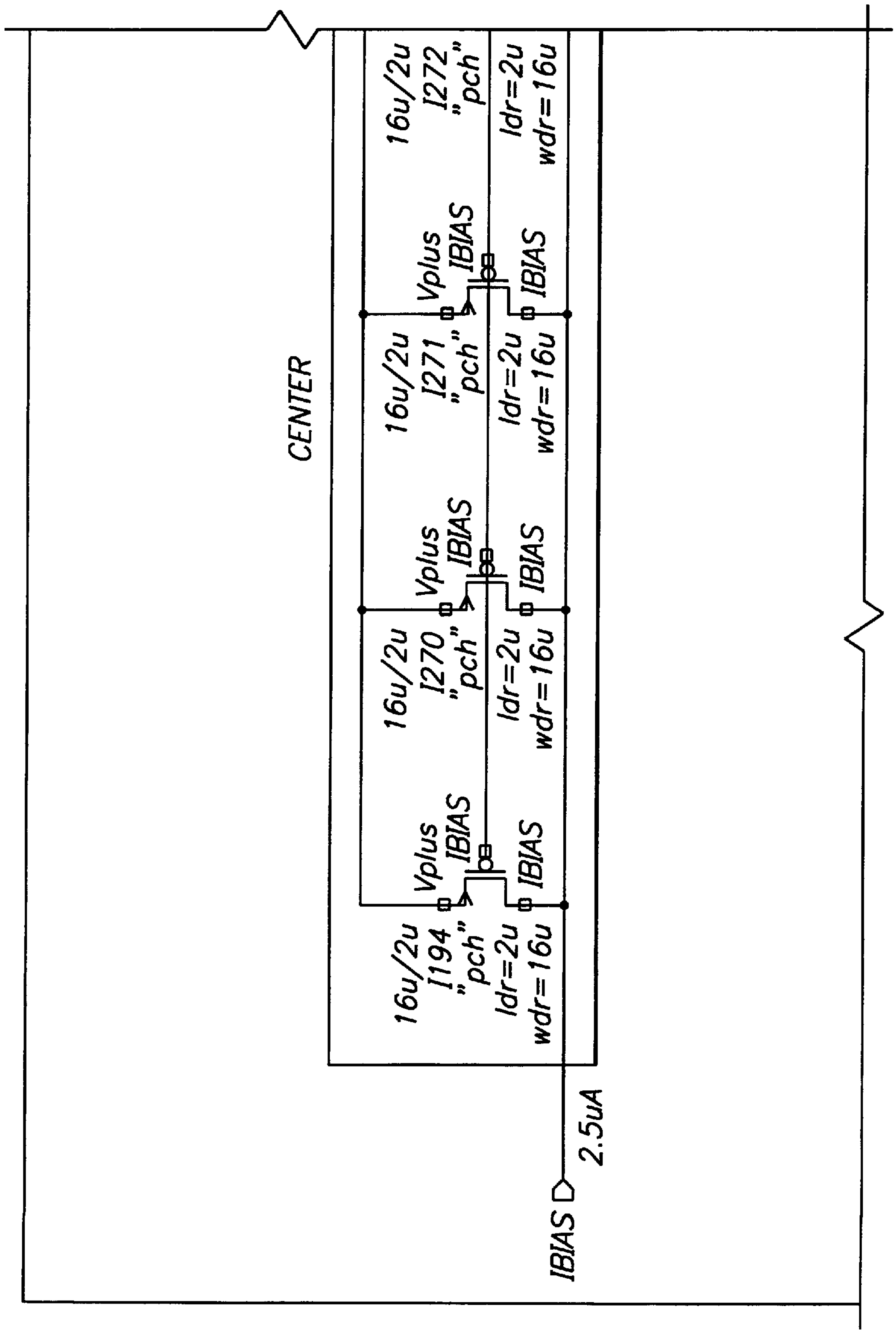
FIG. 9.10.11AA

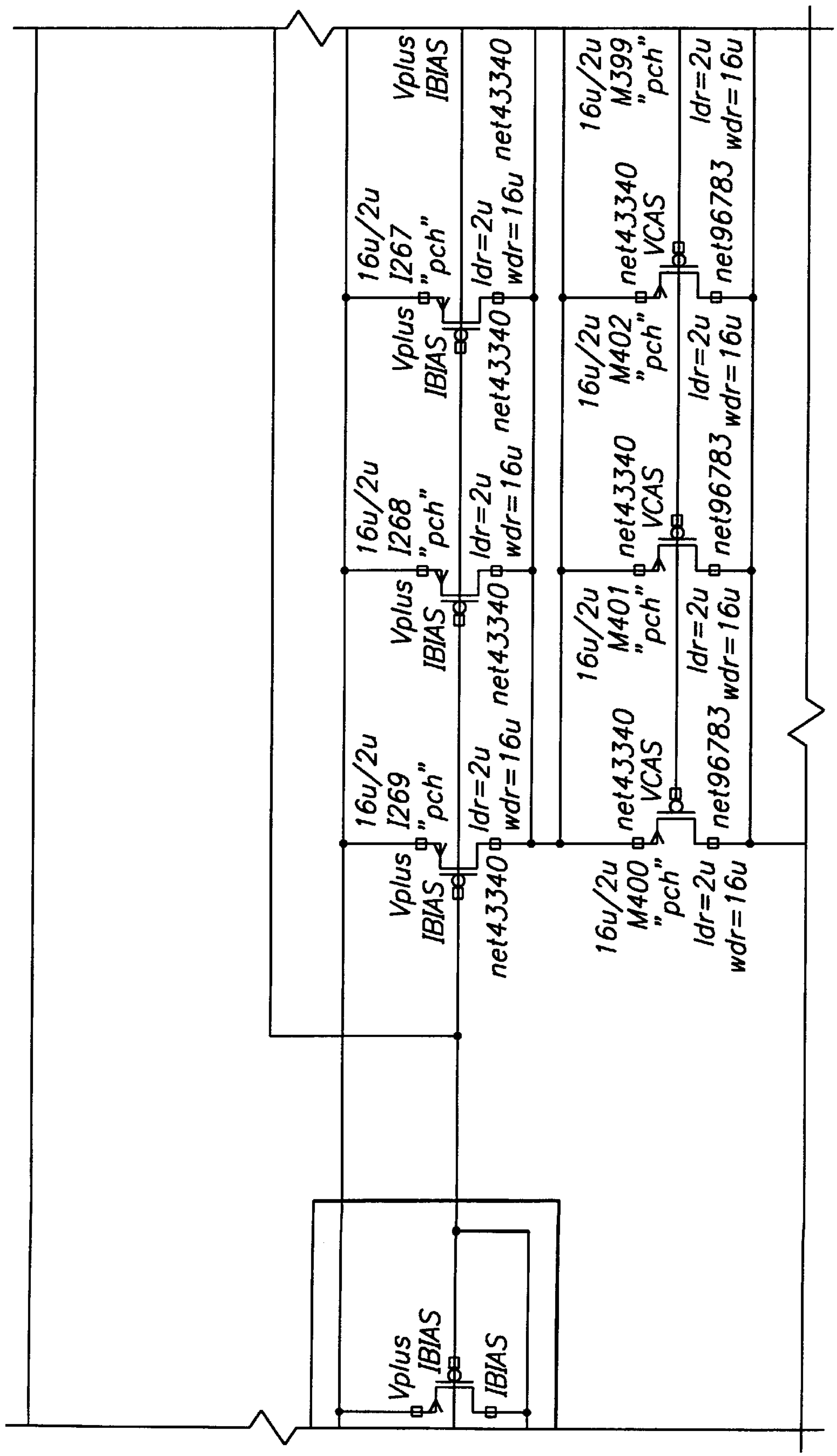
FIG. 9.0101AB

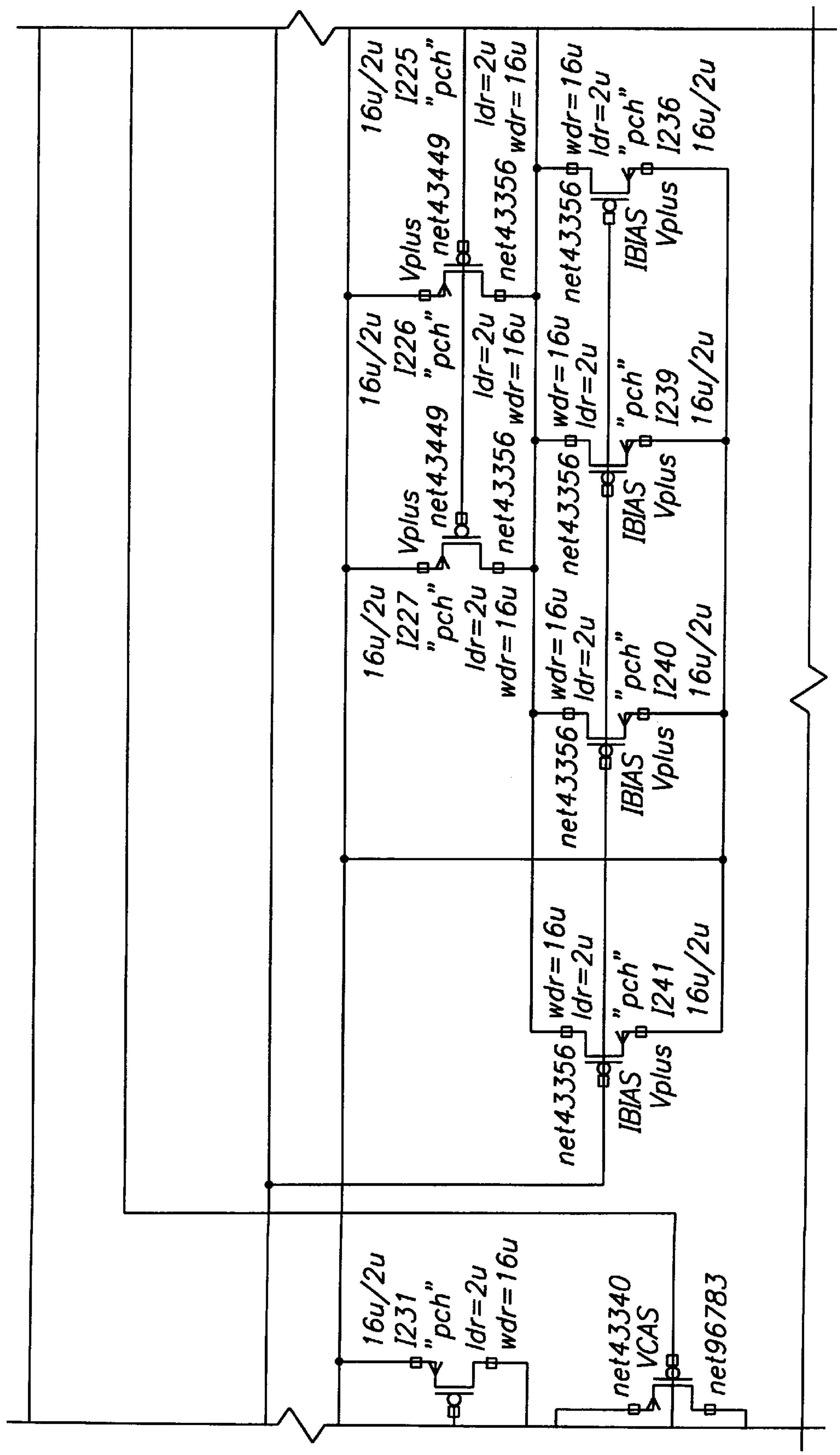
FIG. 9.0101AC

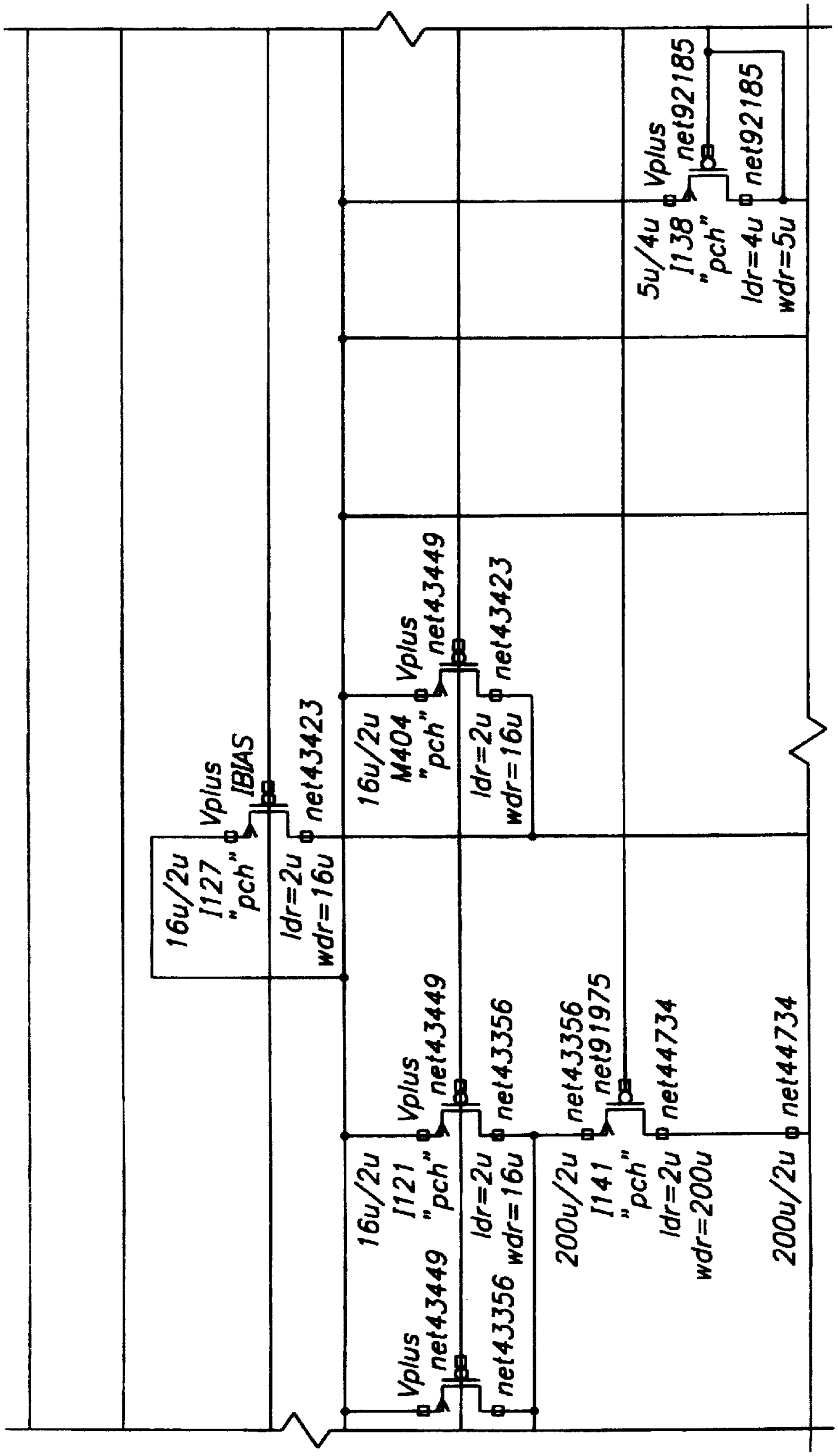
FIG. 9.0101AD

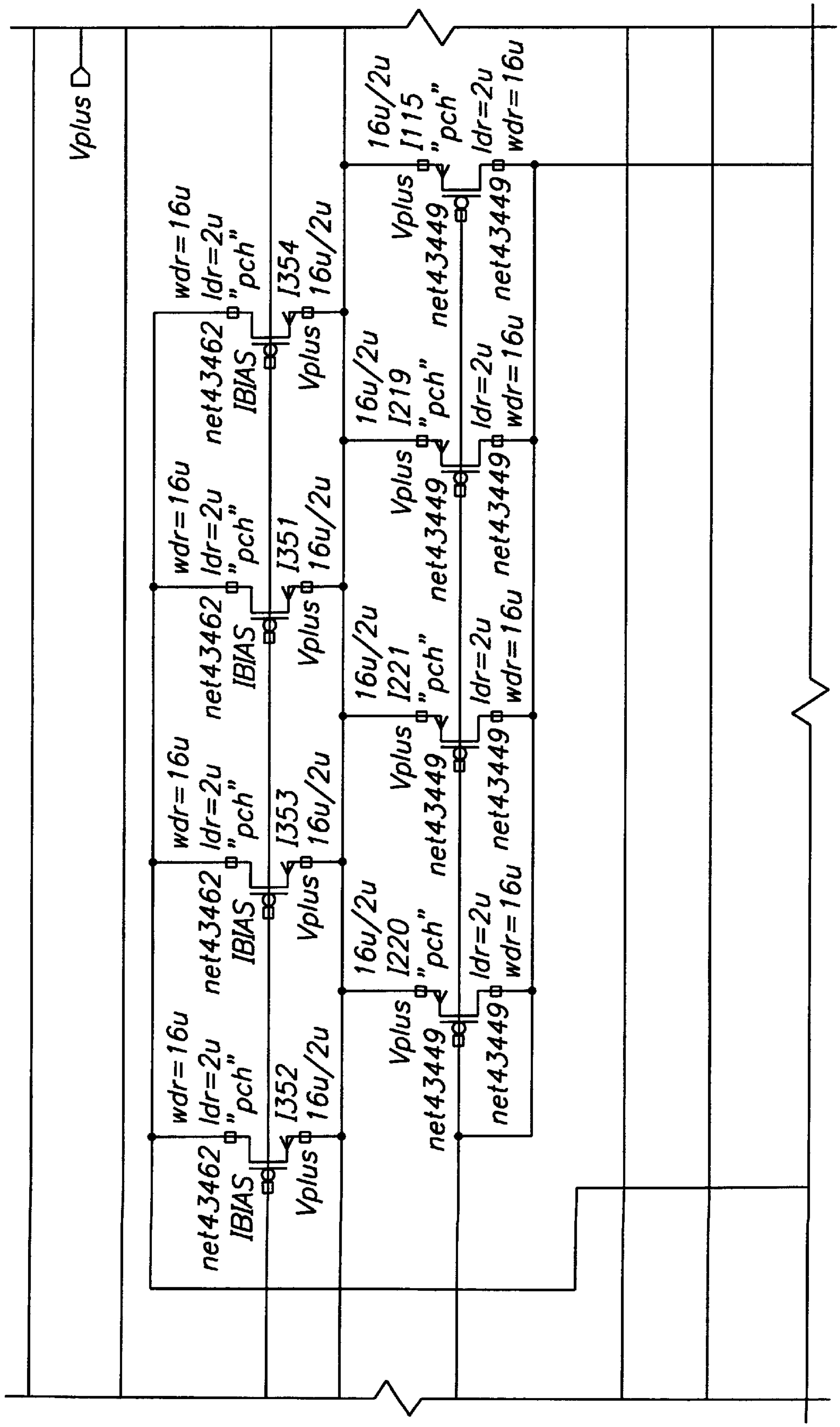
FIG. 9.0101AE

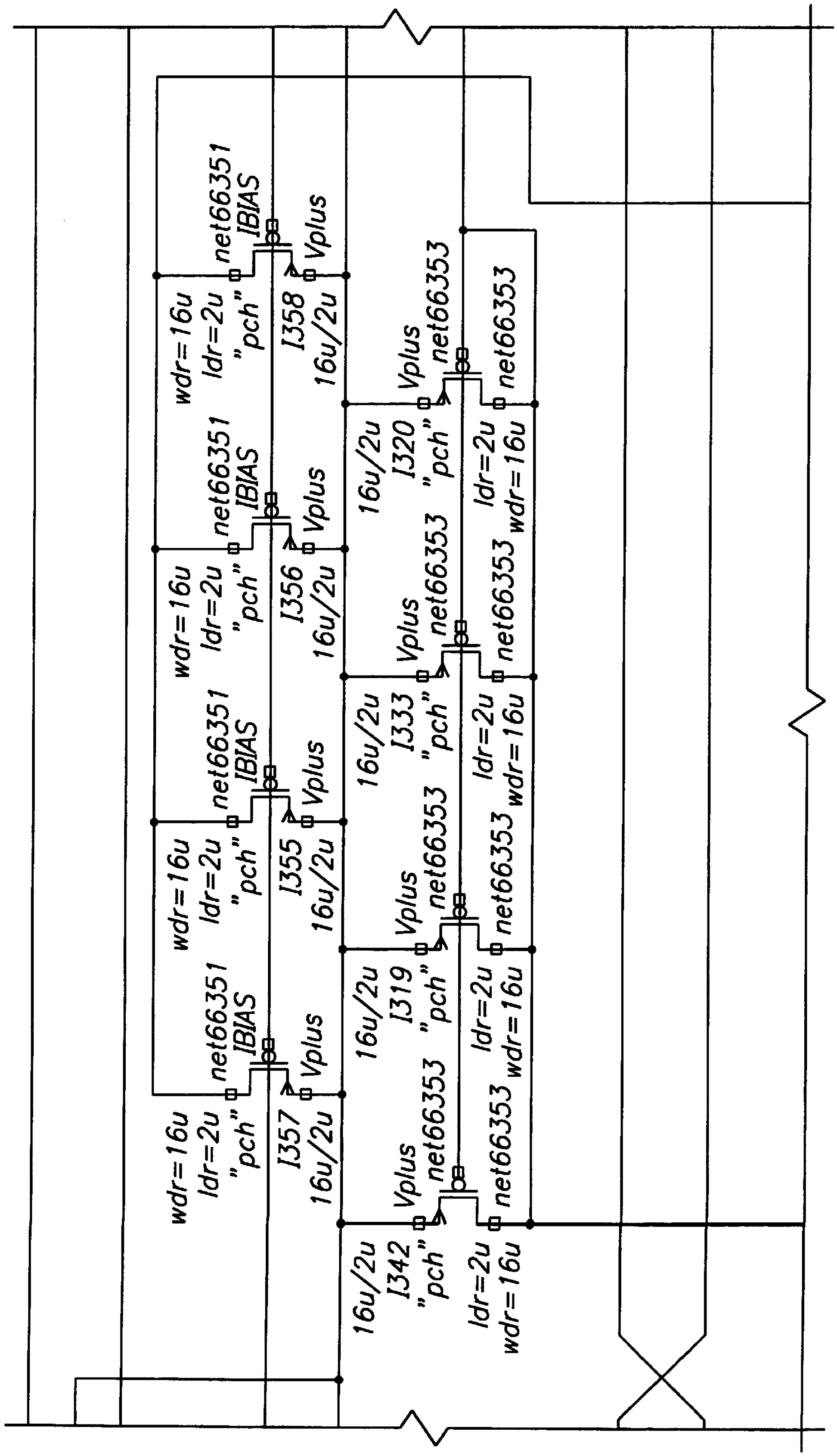
FIG. 9.0101AF

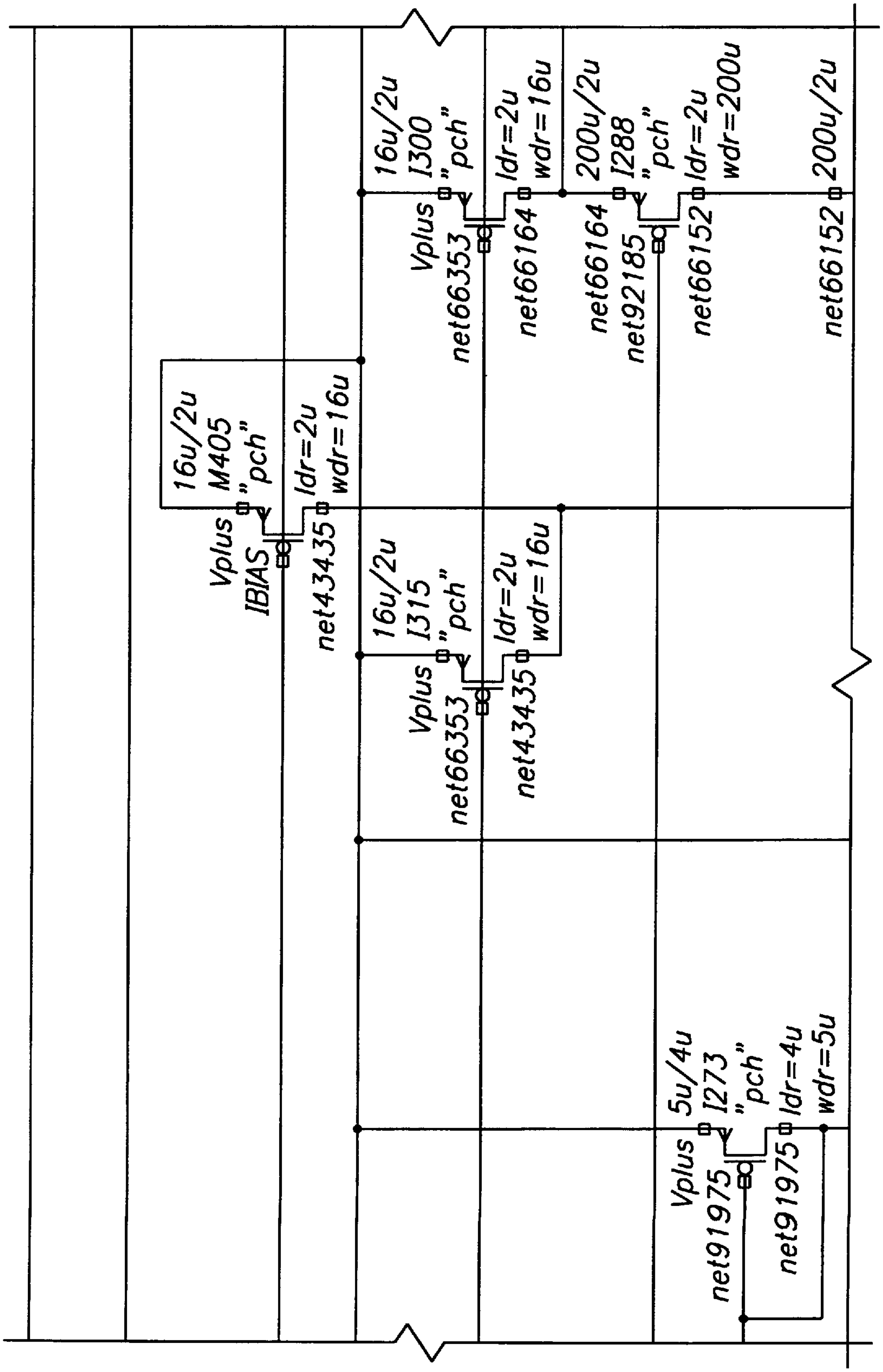
FIG. 9.0101AG

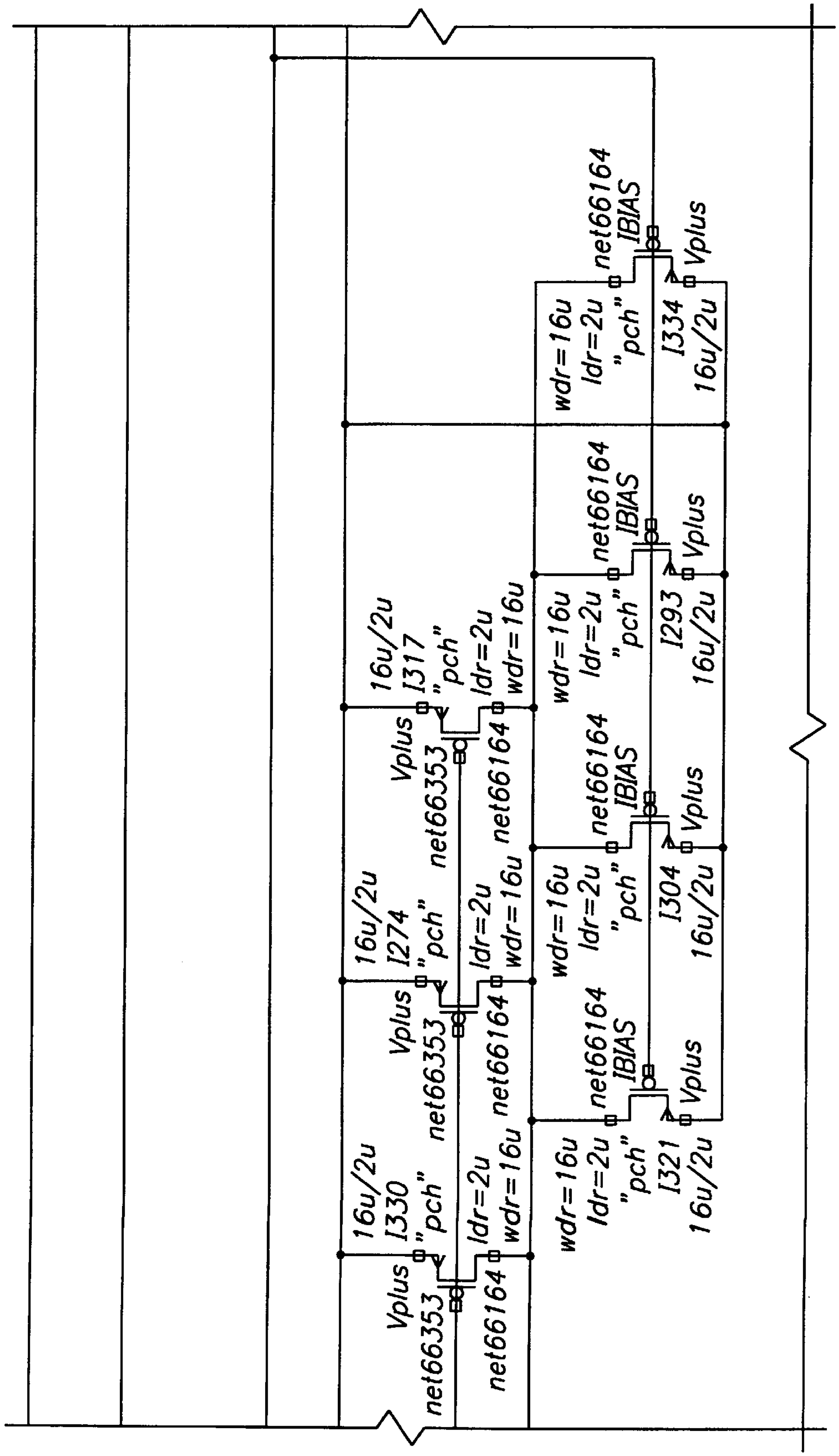
FIG. 9.01AH

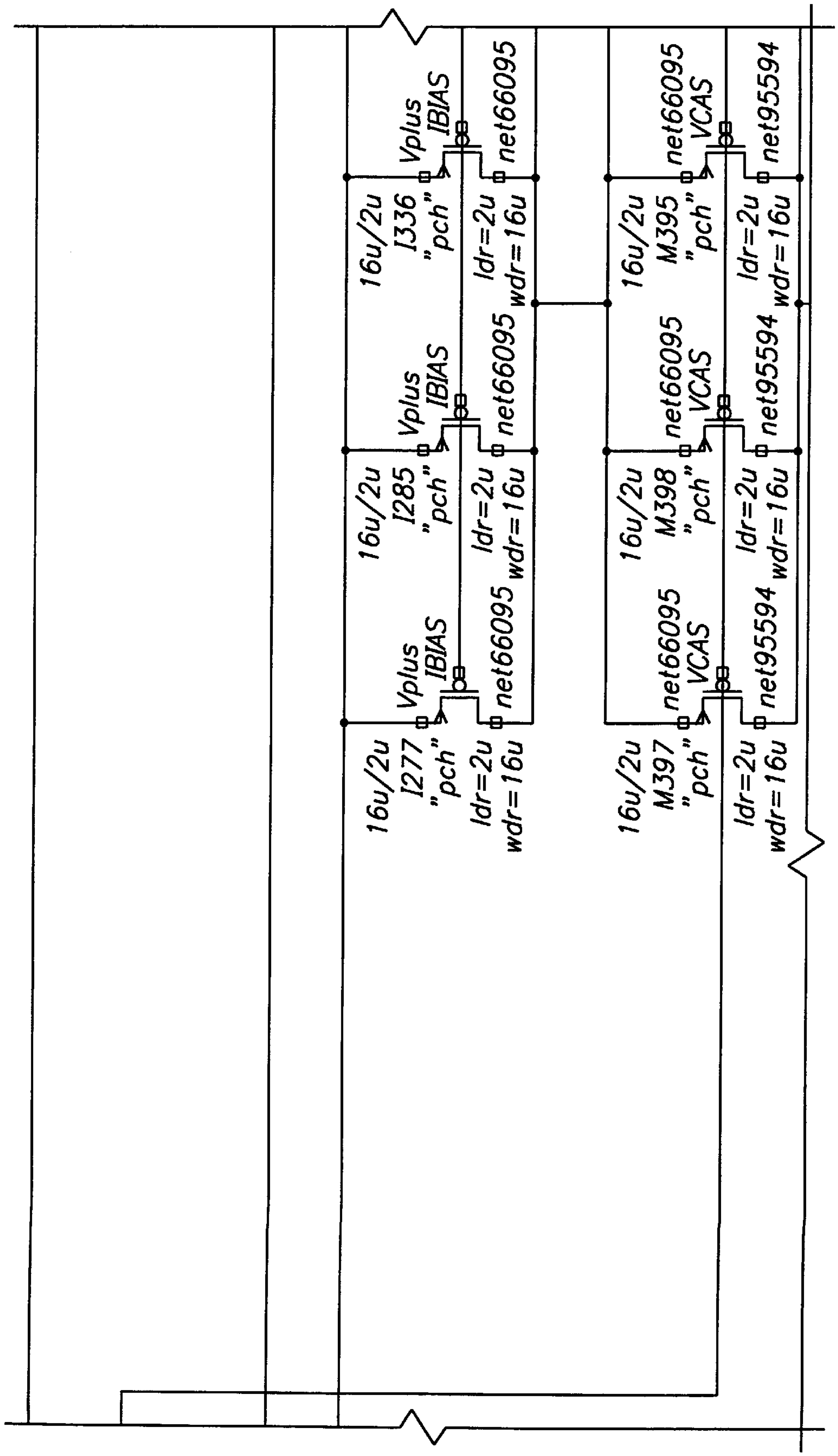
Fig. 9.DIDIAII

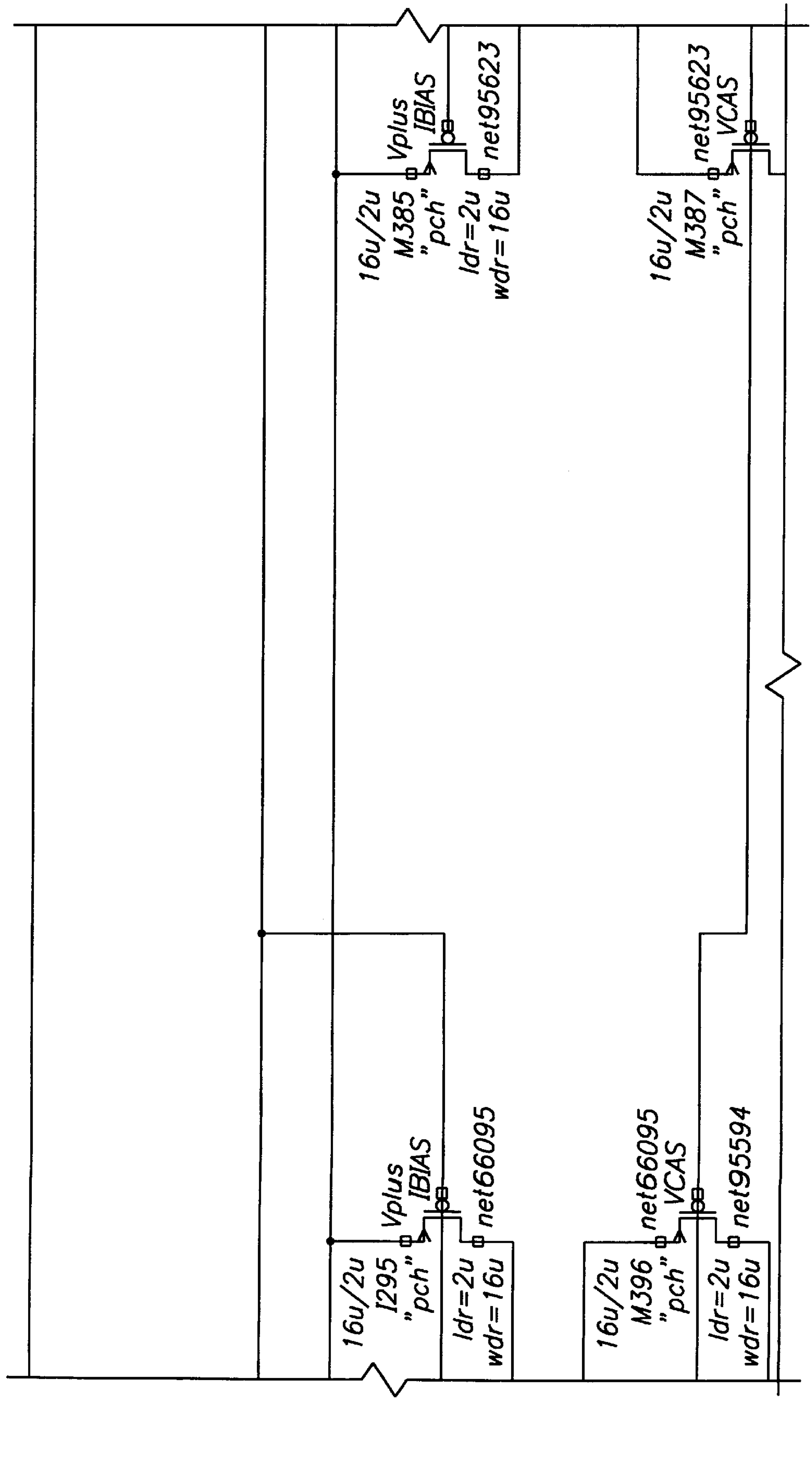
Fig. 9.00101AJ

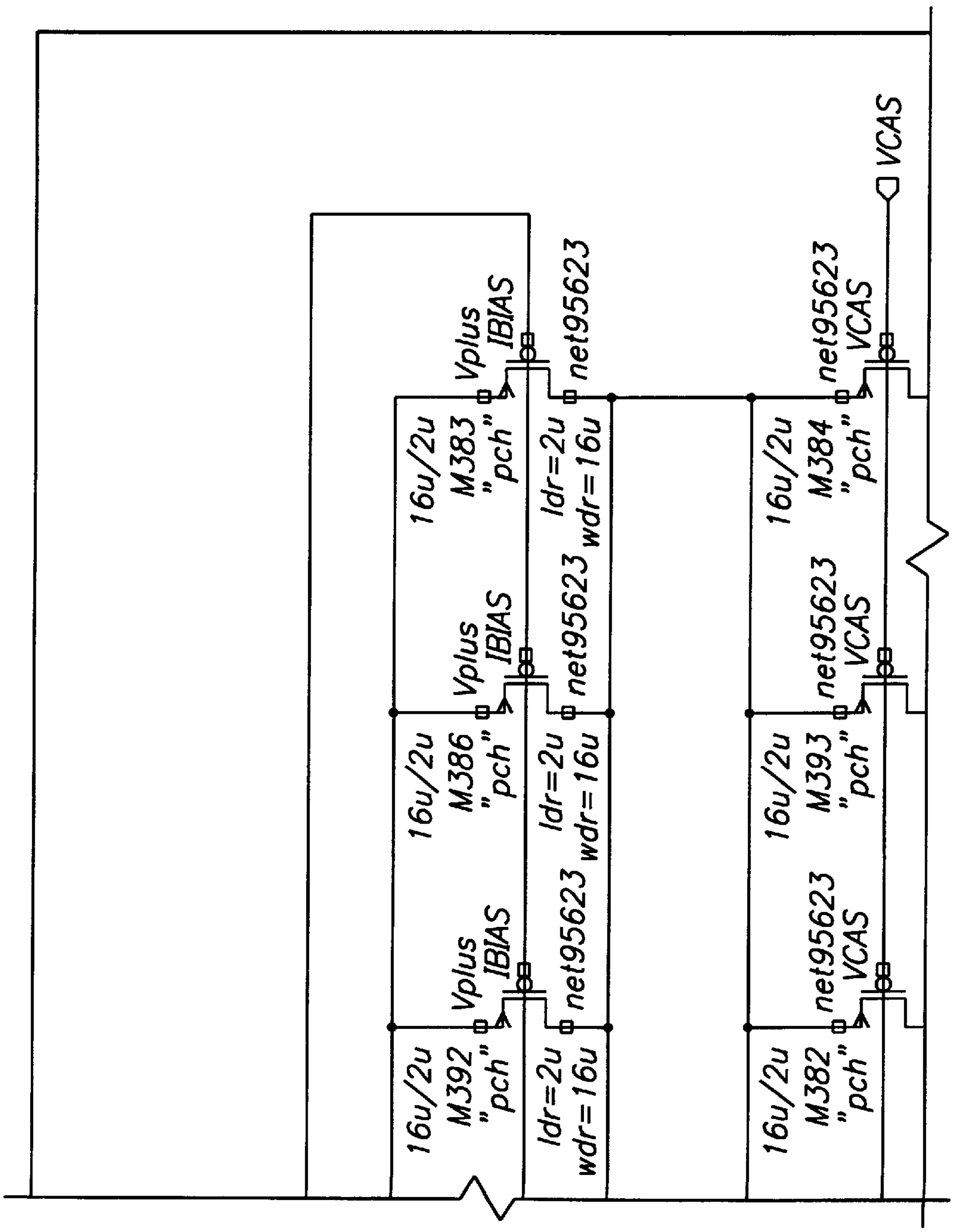
FIG. 9.00.11AK

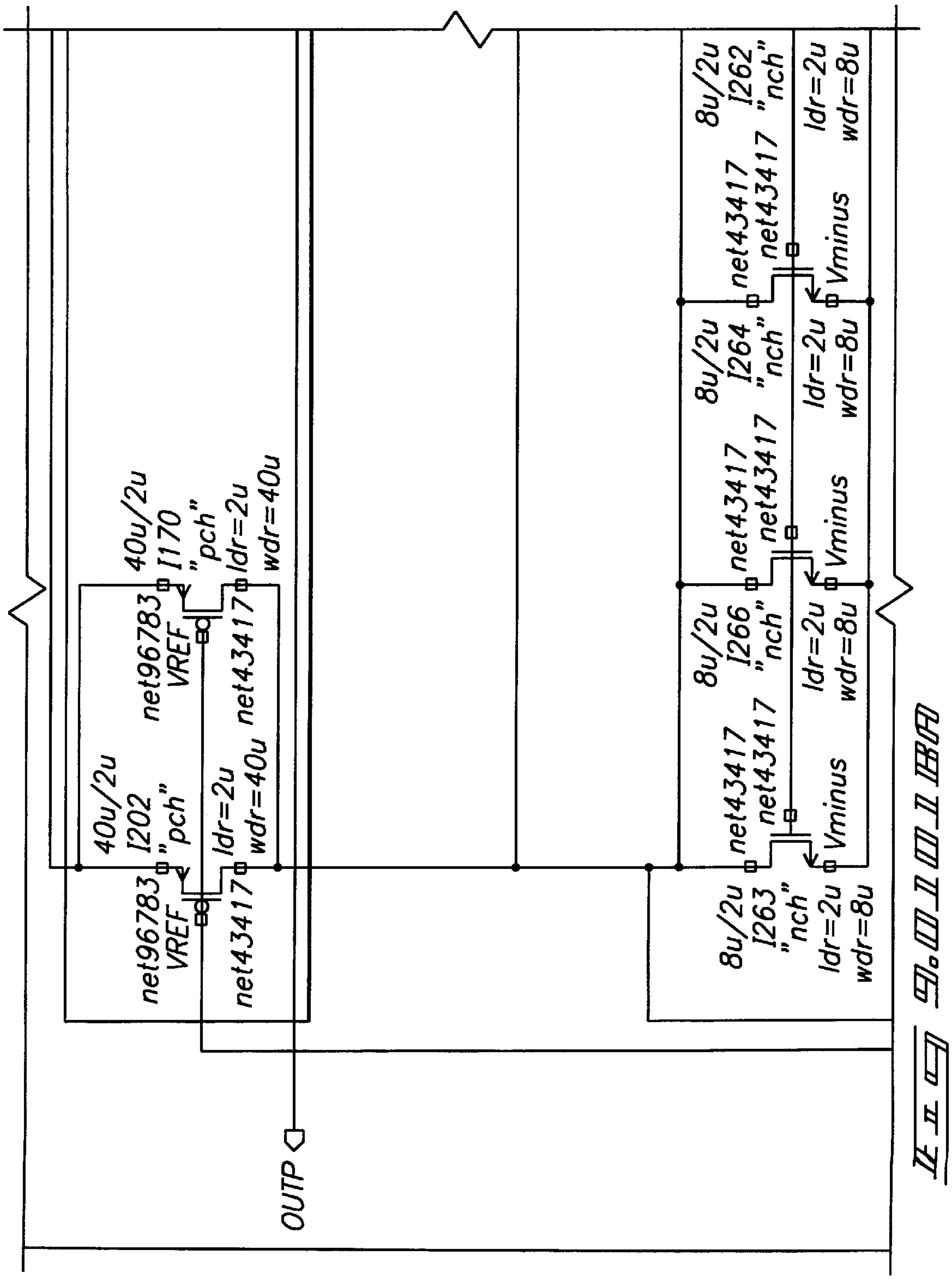
40u/2u
I170
"pch"
ldr=2u
wdr=40u
net96783
VREF
net43417
40u/2u
I202
"pch"
ldr=2u
wdr=40u
OUTP
8u/2u
I262
"nch"
ldr=2u
wdr=8u
net43417
Vminus
8u/2u
I264
"nch"
8u/2u
I266
"nch"
8u/2u
I263
"nch"

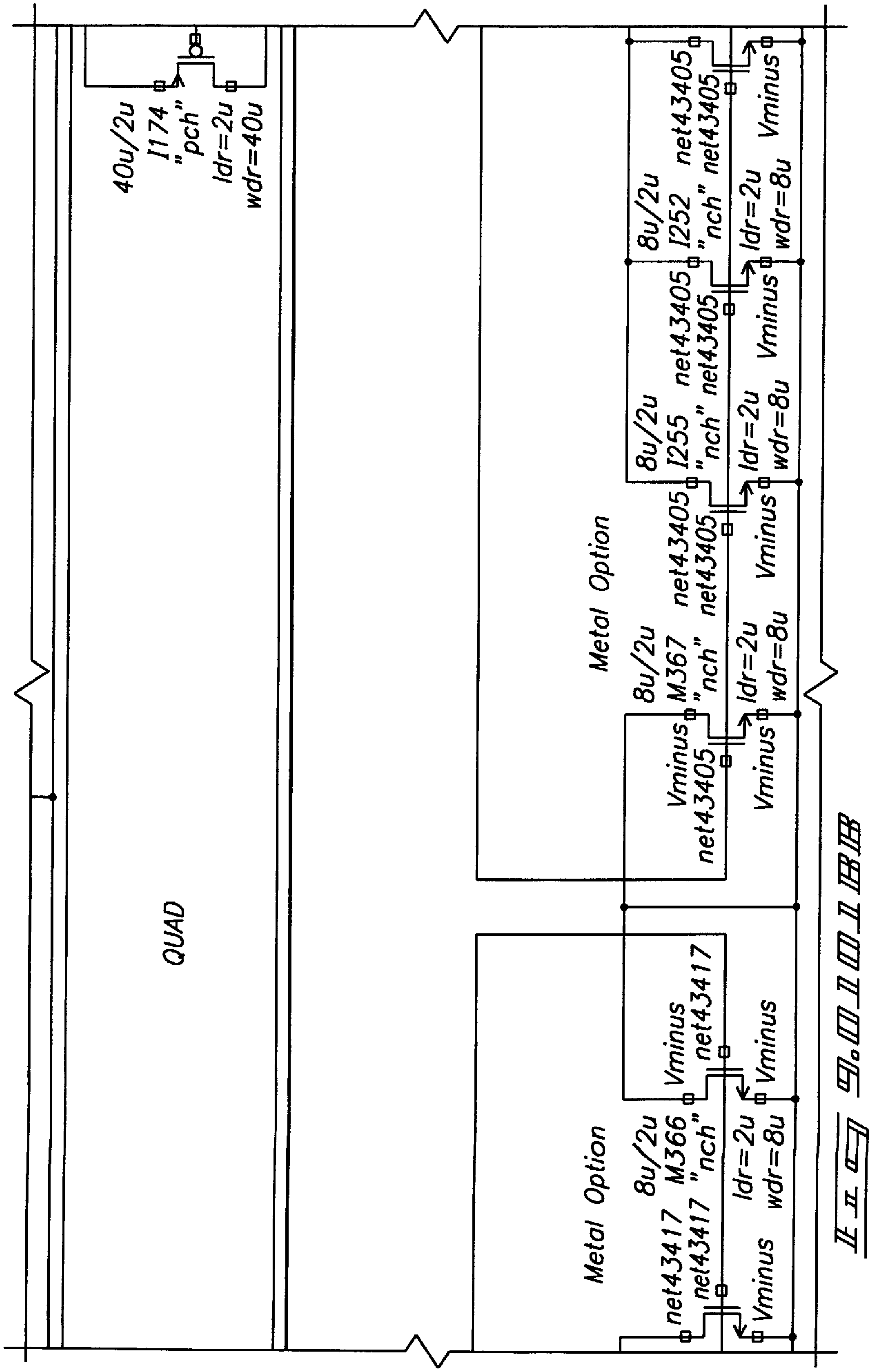
FIG. 9.001BB

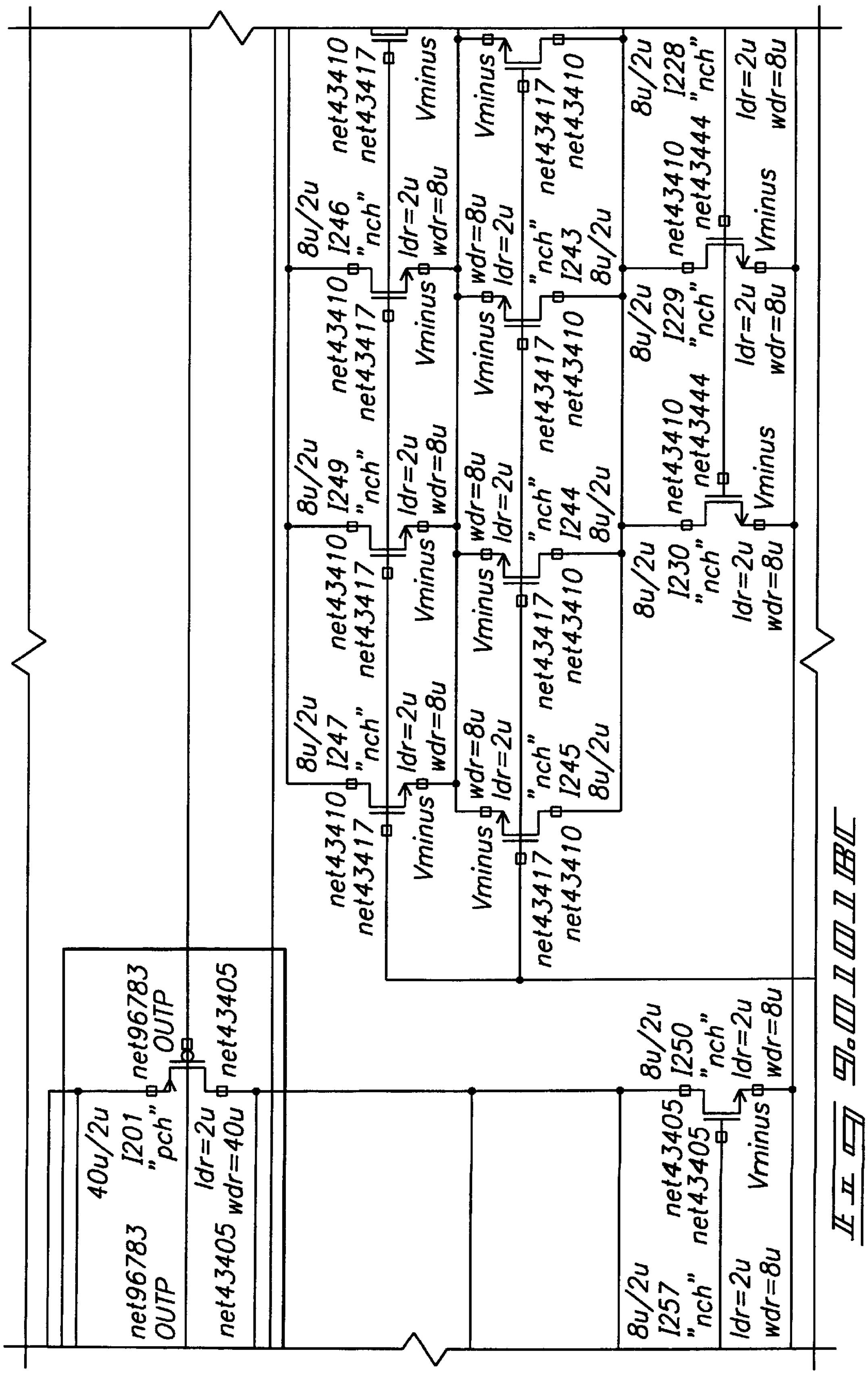
8u/2u
I246
"nch"
ldr=2u
wdr=8u
net43410
net43417
Vminus
8u/2u
I249
"nch"
8u/2u
I247
"nch"
wdr=8u
ldr=2u
"nch"
I243
8u/2u
I244
I245
8u/2u
I228
"nch"
8u/2u
I229
"nch"
8u/2u
I230
"nch"
net43444
40u/2u
I201
"pch"
ldr=2u
wdr=40u
net96783
OUTP
net43405
8u/2u
I250
"nch"
8u/2u
I257
"nch"

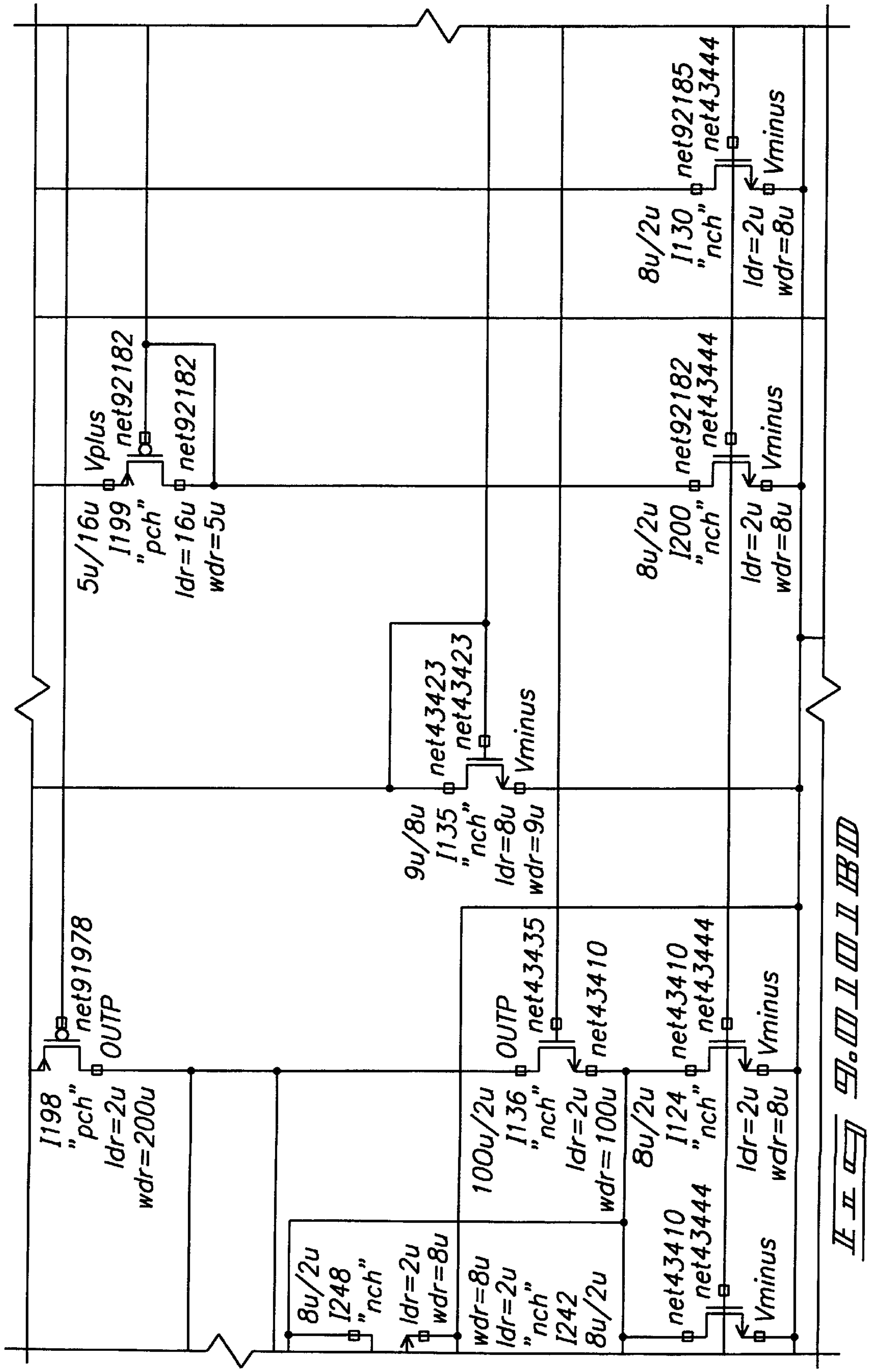
Fig. 9.III.IIB

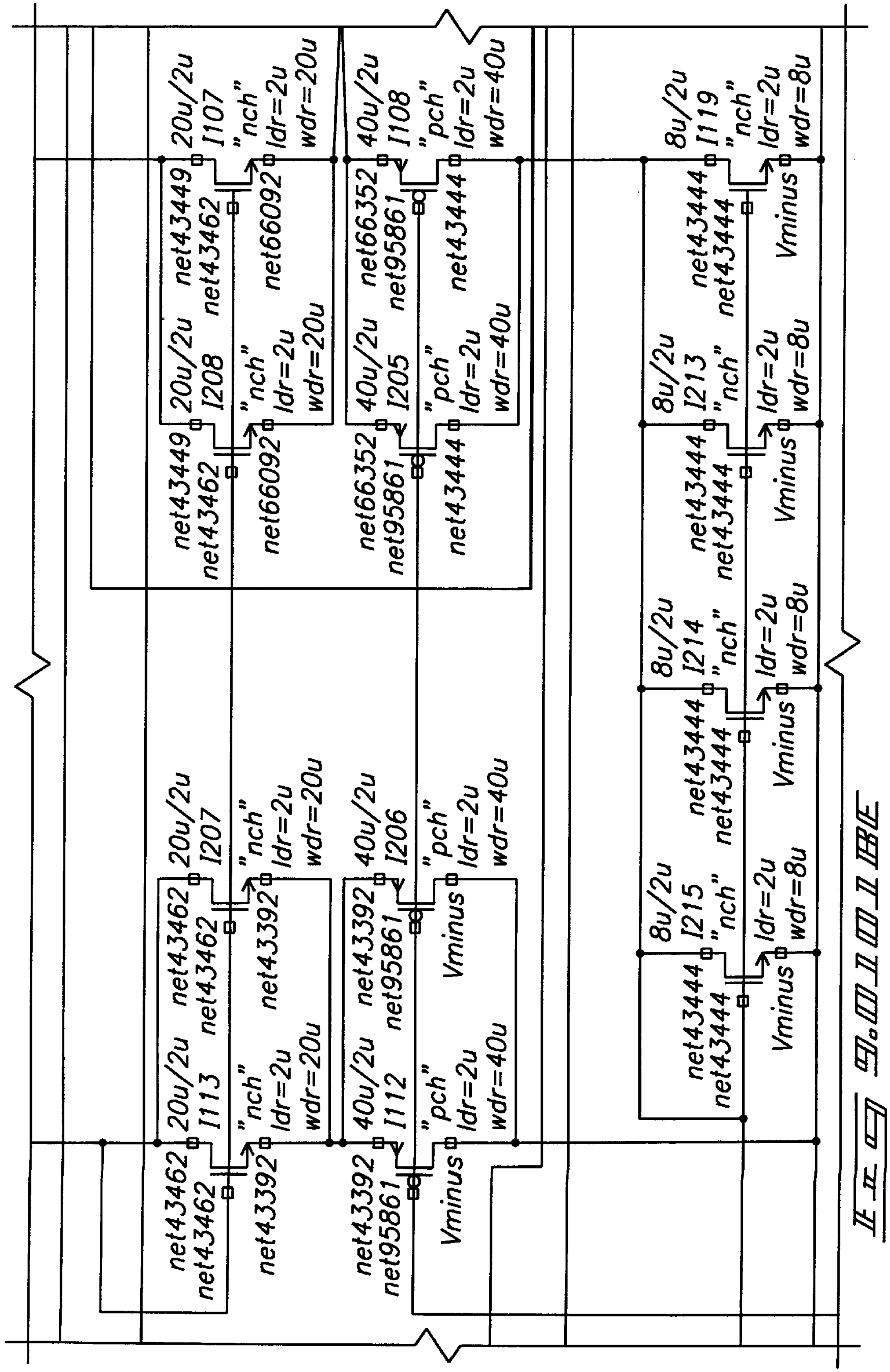

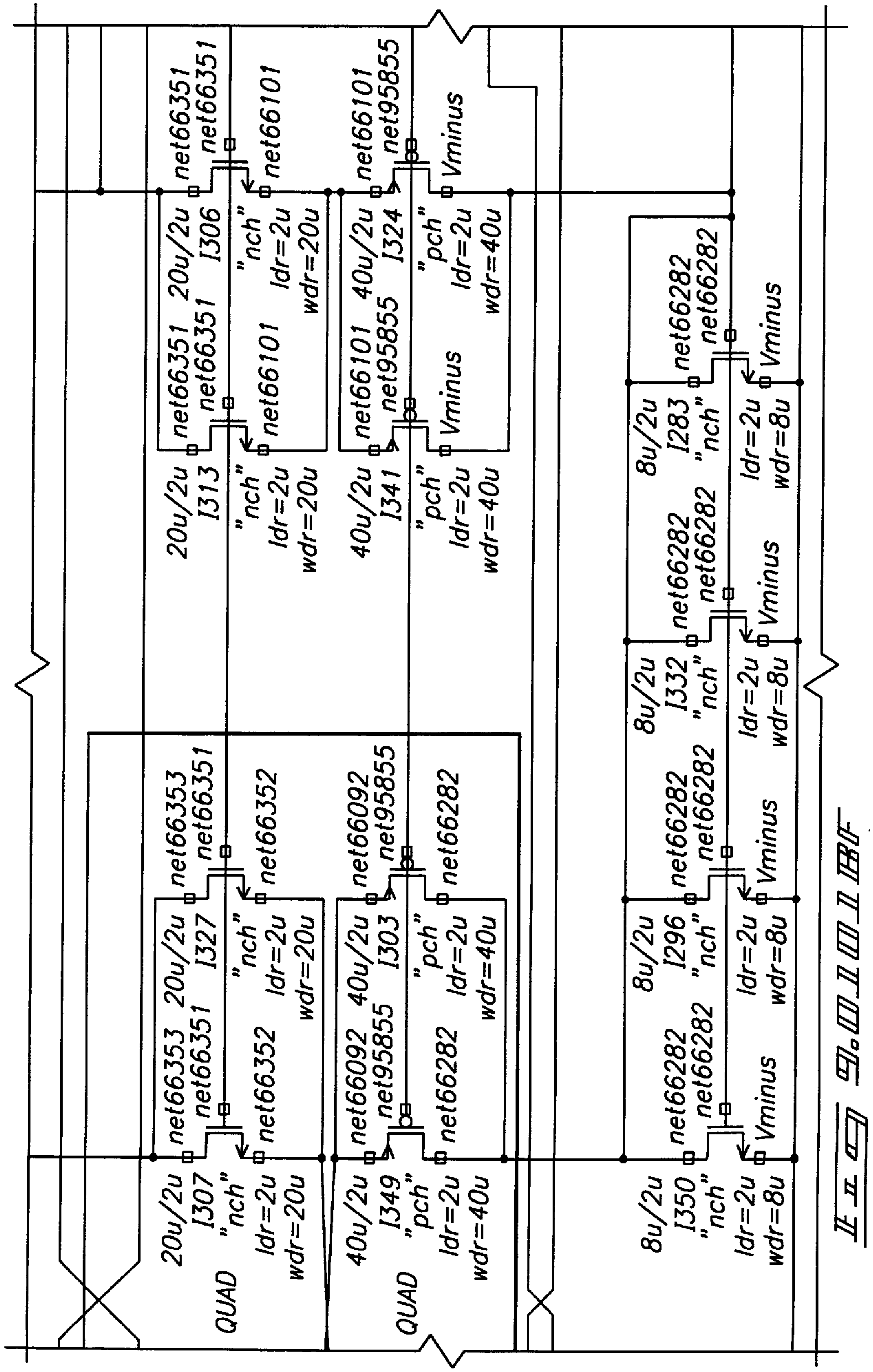

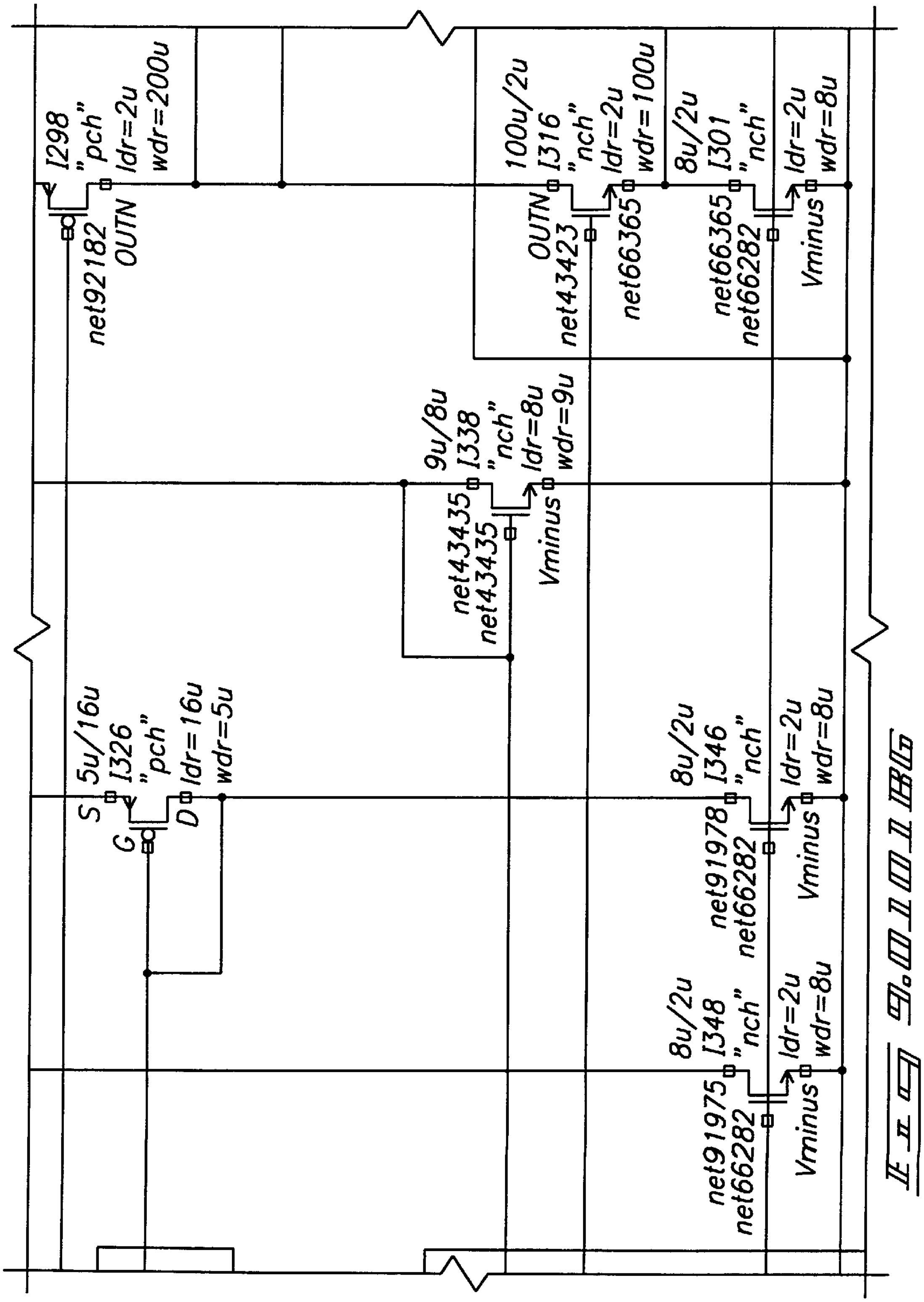
Fig. 9.00.11BG

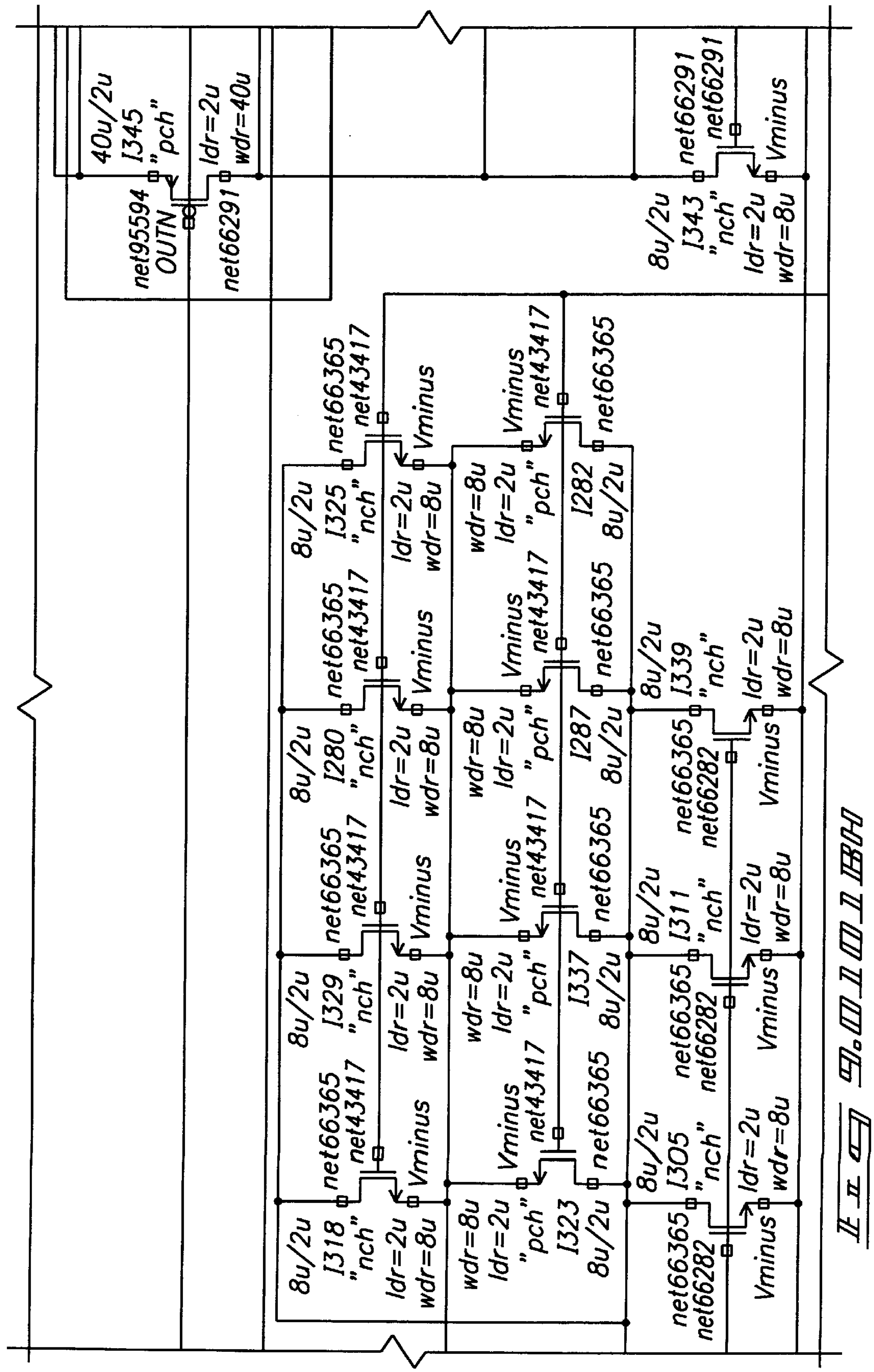

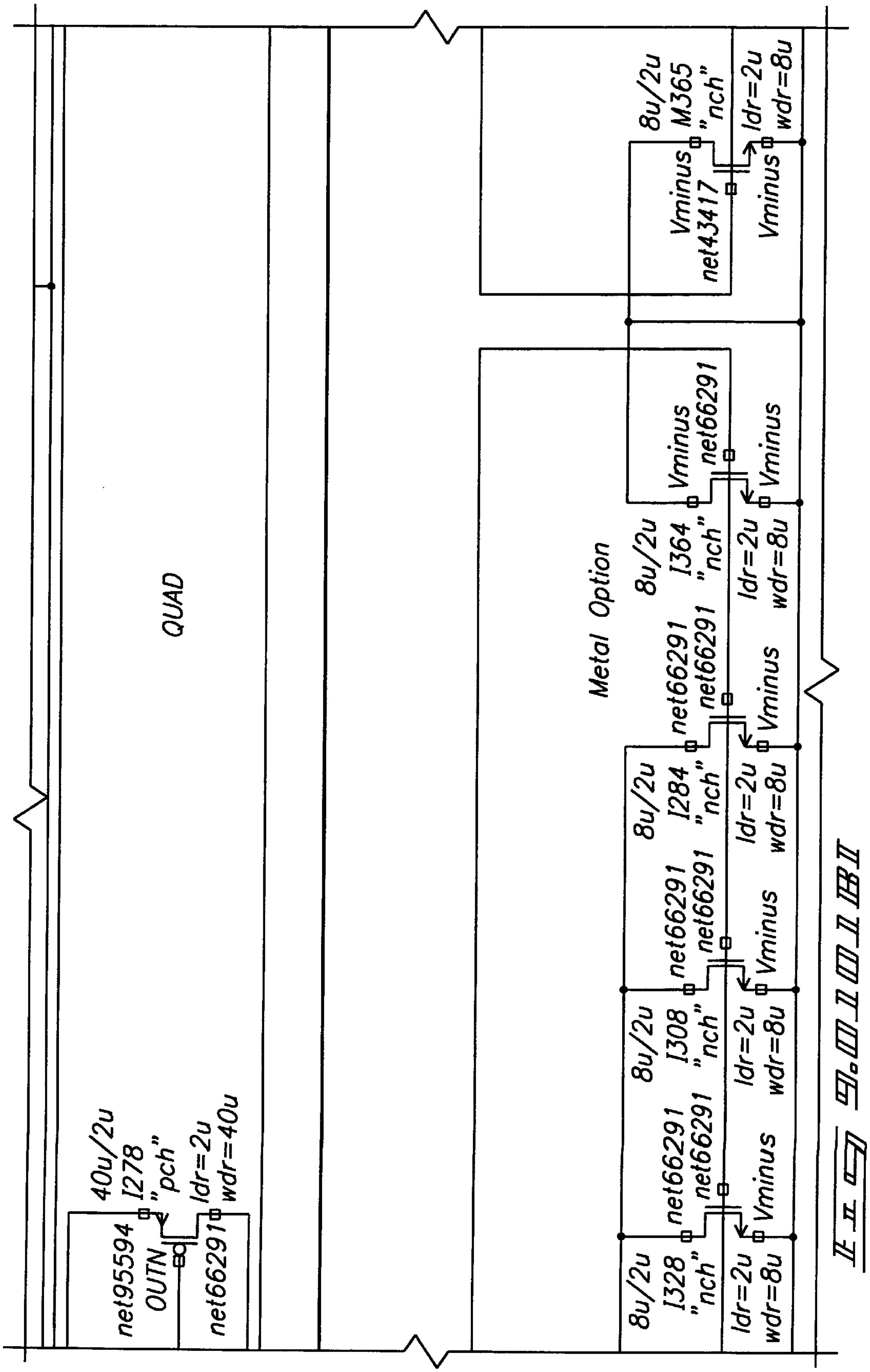
QUAD
40u/2u
I278
"pch"
ldr=2u
wdr=40u
net95594
OUTN
net66291
Metal Option
8u/2u
M365
"nch"
ldr=2u
wdr=8u
Vminus
net43417
Vminus
Vminus
net66291
Vminus
8u/2u
I364
"nch"
ldr=2u
wdr=8u
net66291
net66291
Vminus
8u/2u
I284
"nch"
ldr=2u
wdr=8u
net66291
net66291
Vminus
8u/2u
I308
"nch"
ldr=2u
wdr=8u
net66291
net66291
Vminus
8u/2u
I328
"nch"
ldr=2u
wdr=8u

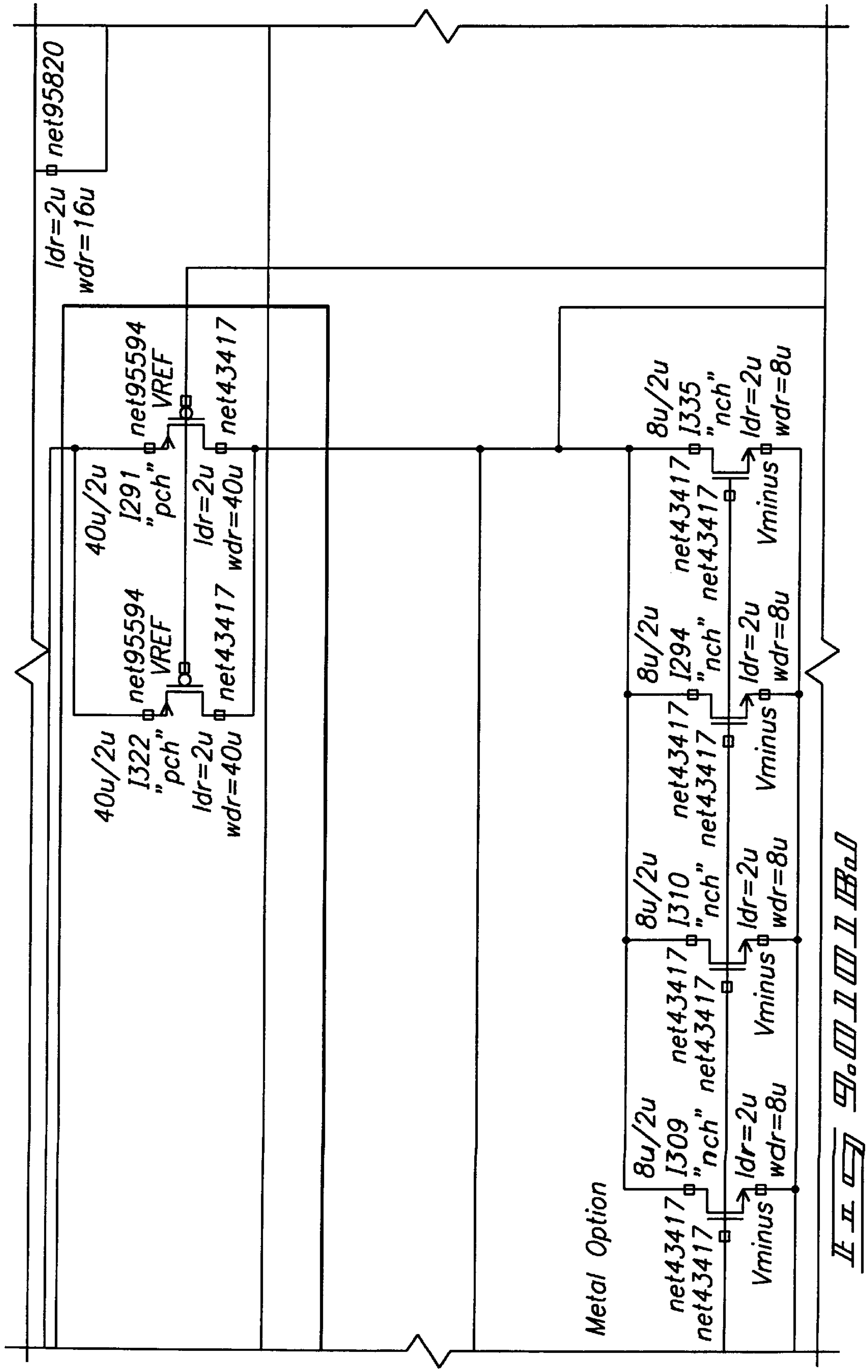
Fig. 9.0101Ba

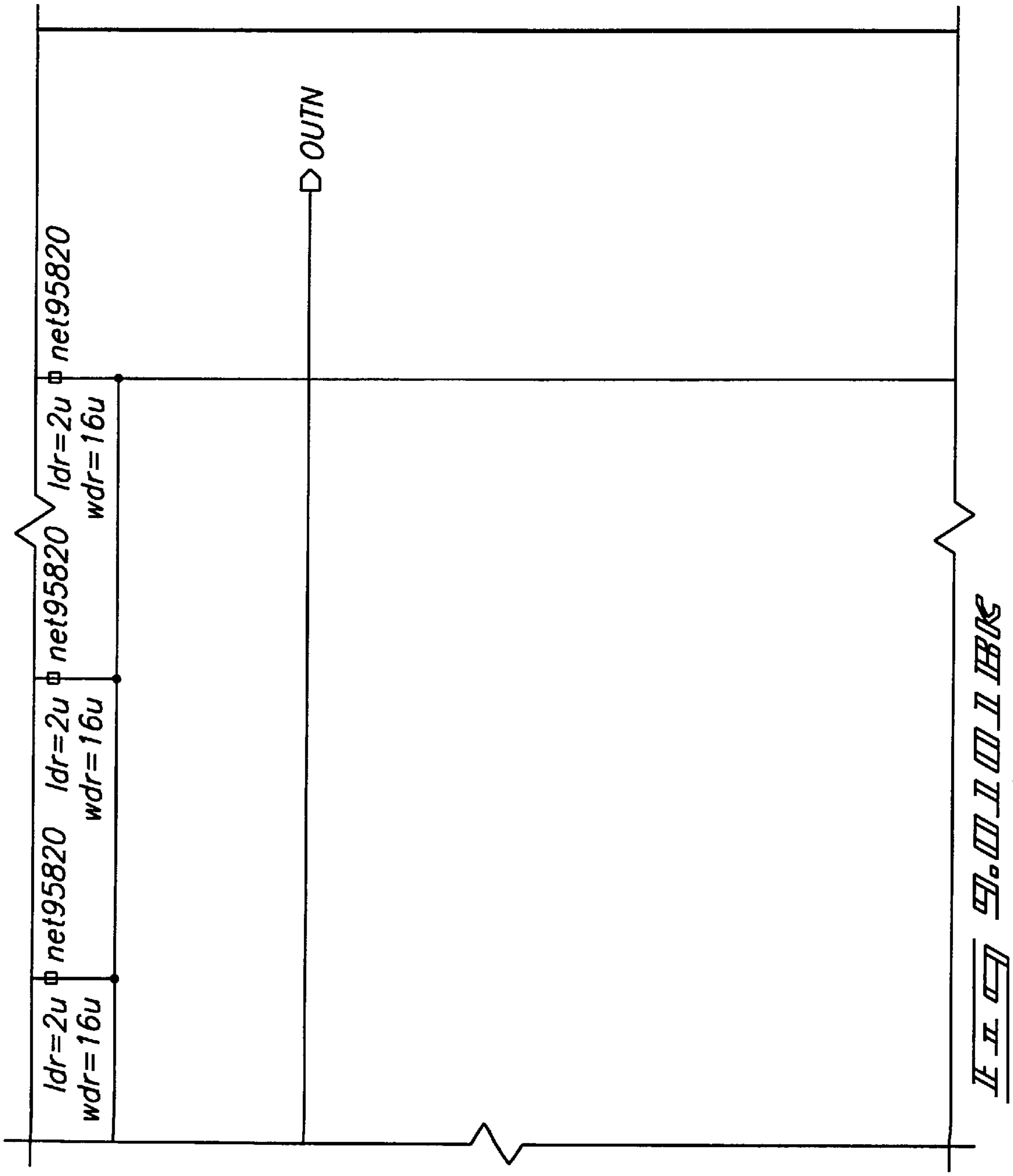
FIG. 9.0101BK

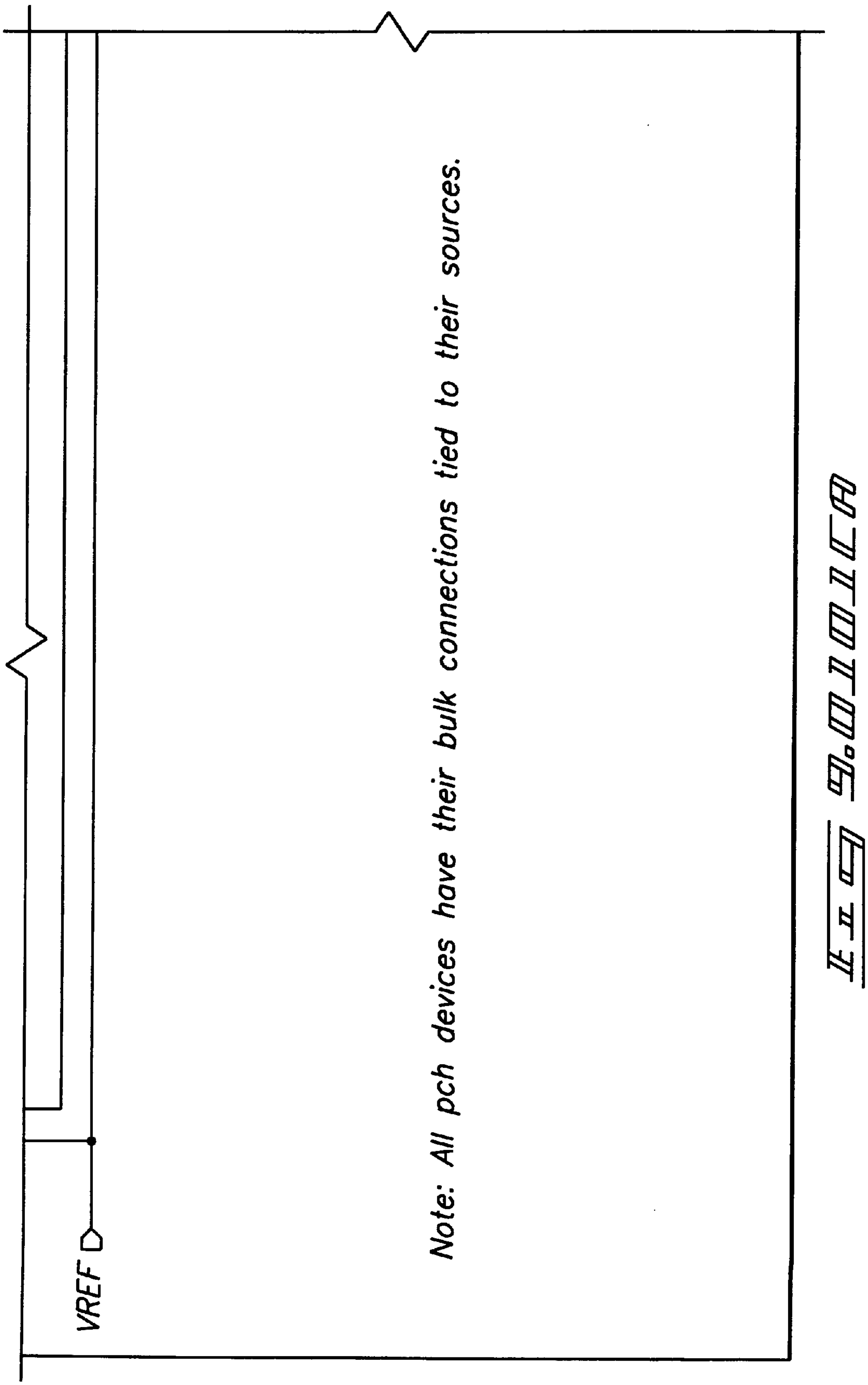
Fig. 9.0101CA

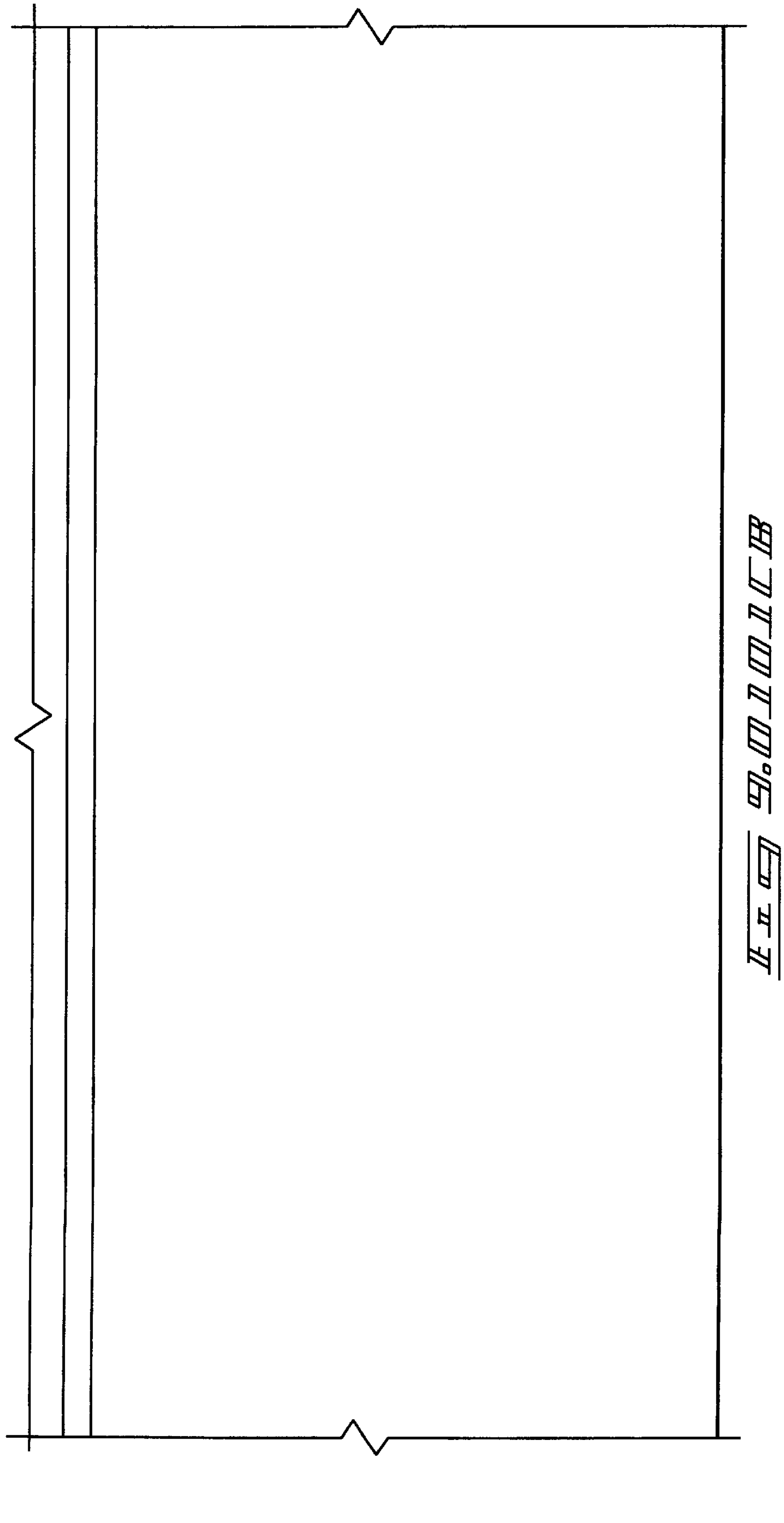
Fig 9.010LB

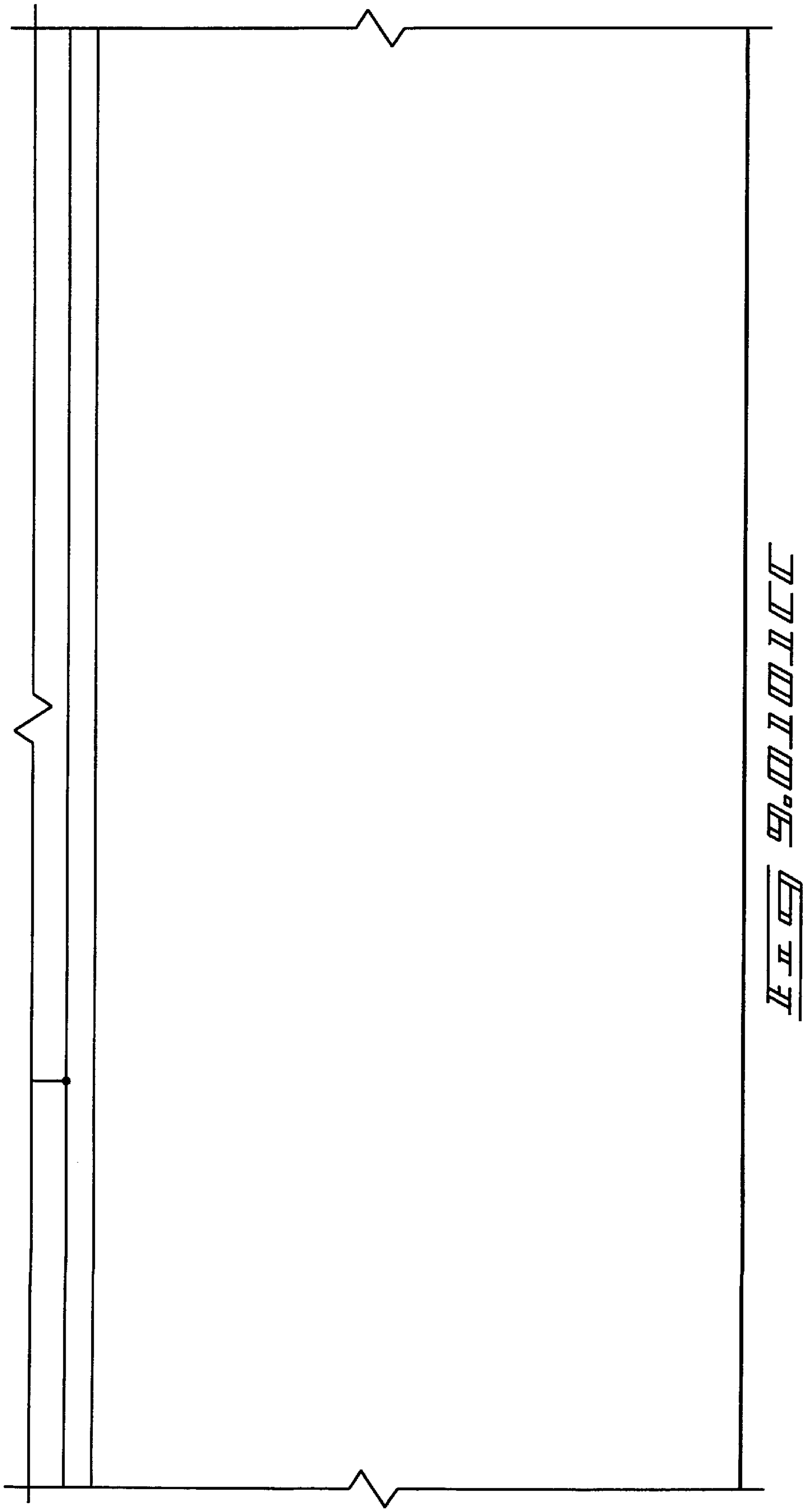
FIG. 9.0101CC

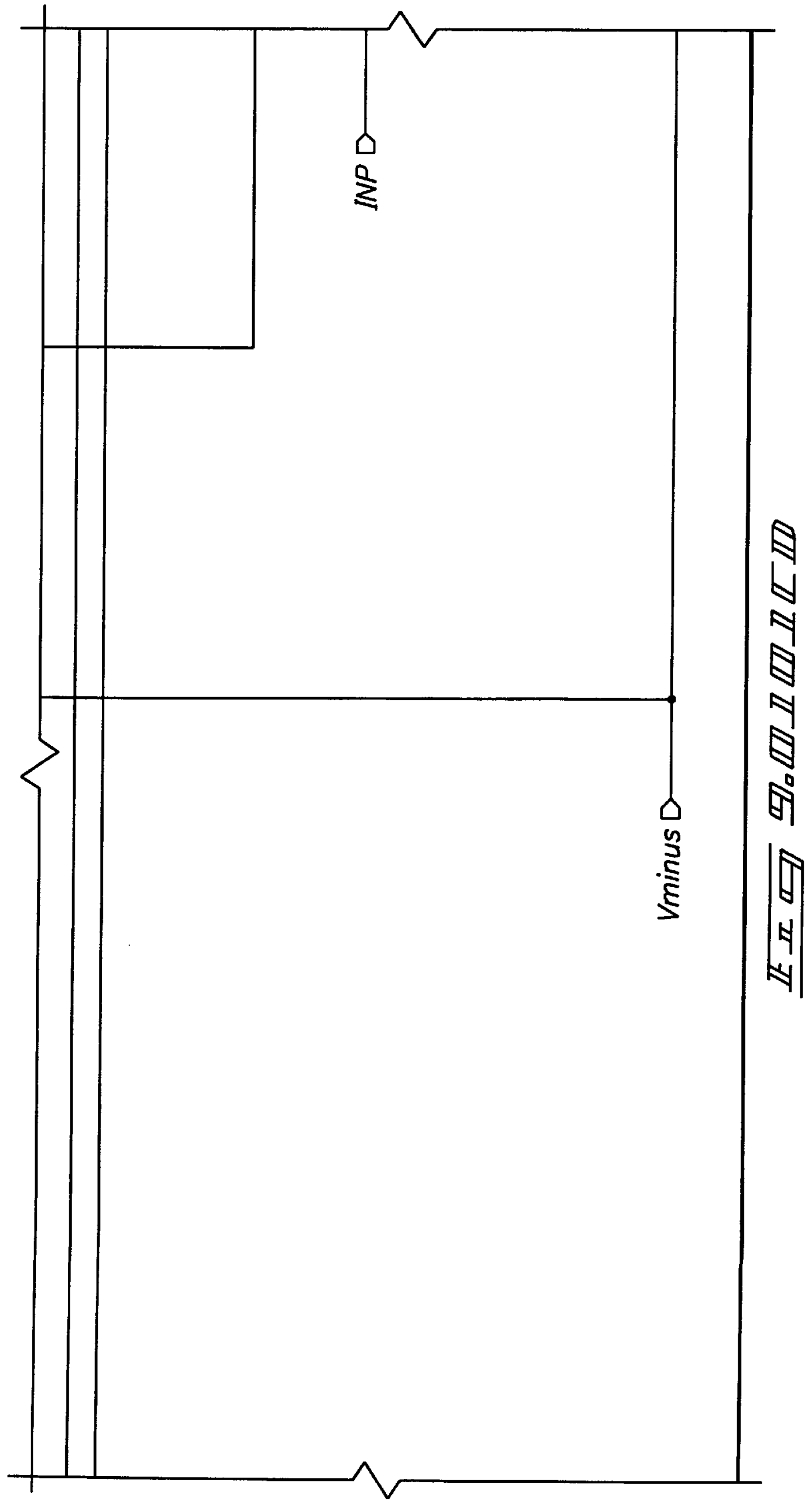
Fig. 9.0101CD

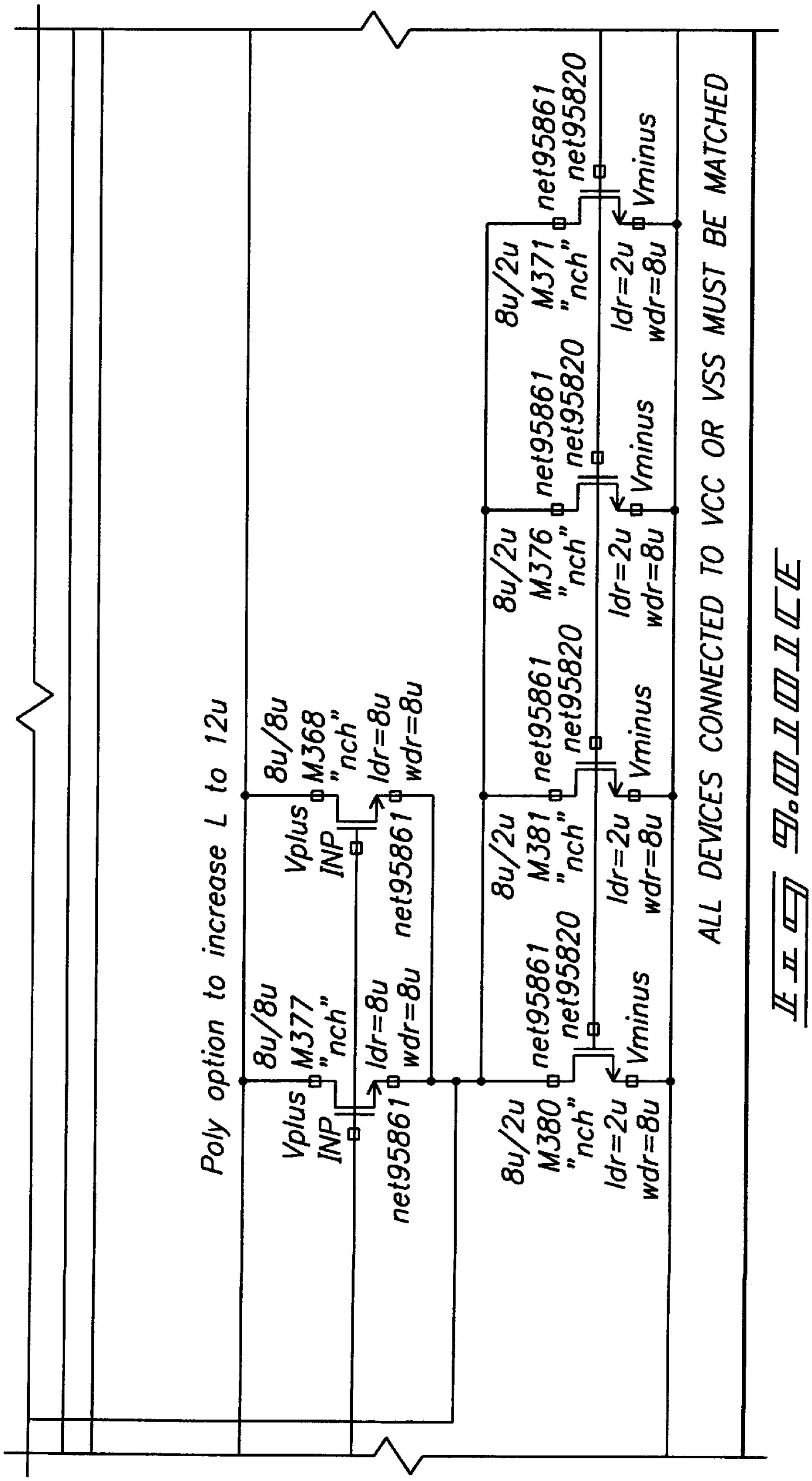
Poly option to increase L to 12u
8u/8u
M377
"nch"
Vplus
INP
ldr=8u
wdr=8u
net95861
8u/8u
M368
"nch"
Vplus
INP
ldr=8u
wdr=8u
net95861
8u/2u
M380
"nch"
ldr=2u
wdr=8u
net95861
net95820
Vminus
8u/2u
M381
"nch"
ldr=2u
wdr=8u
net95861
net95820
Vminus
8u/2u
M376
"nch"
ldr=2u
wdr=8u
net95861
net95820
Vminus
8u/2u
M371
"nch"
ldr=2u
wdr=8u
net95861
net95820
Vminus
ALL DEVICES CONNECTED TO VCC OR VSS MUST BE MATCHED

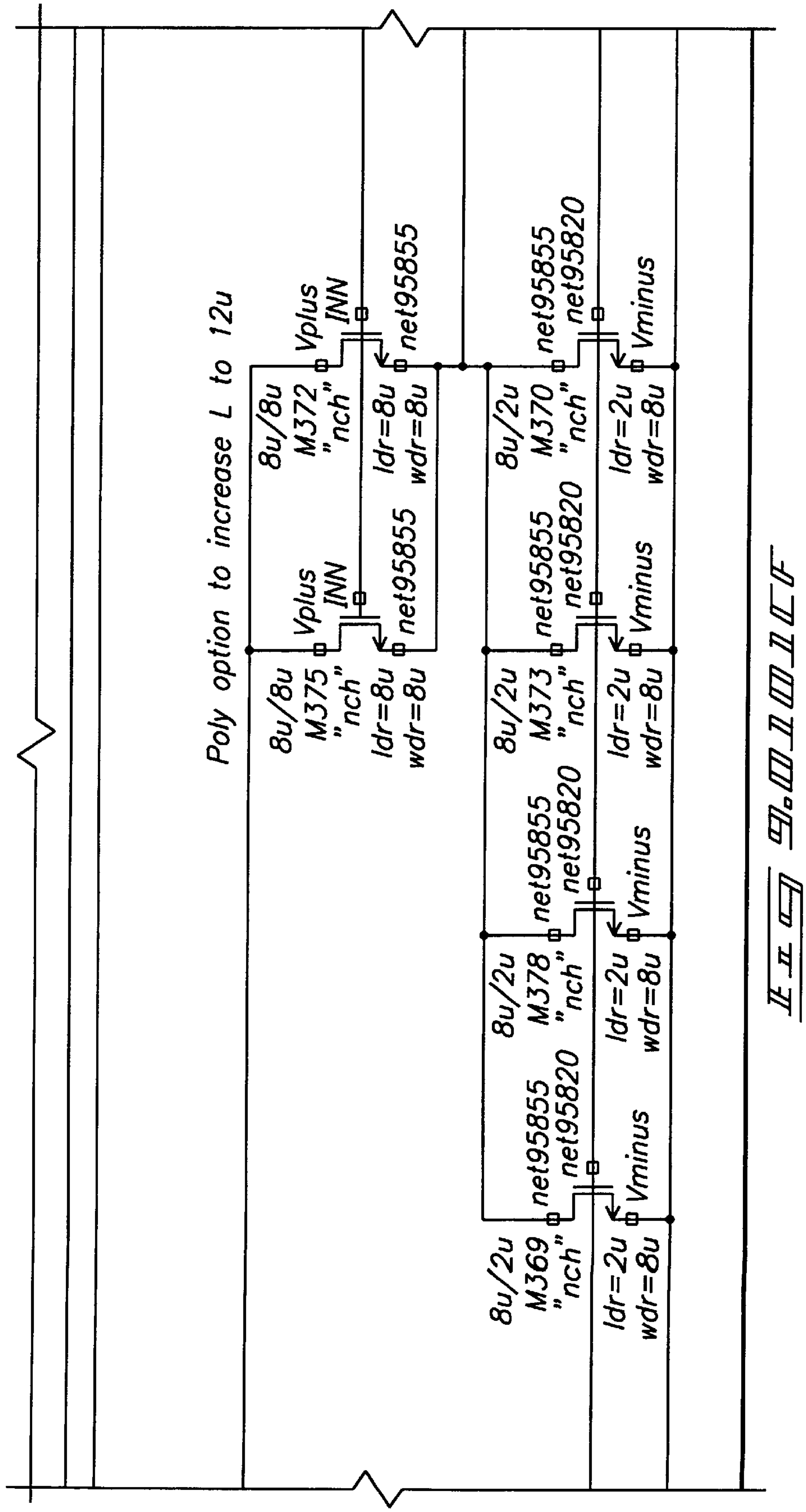
FIG. 9.01ICF

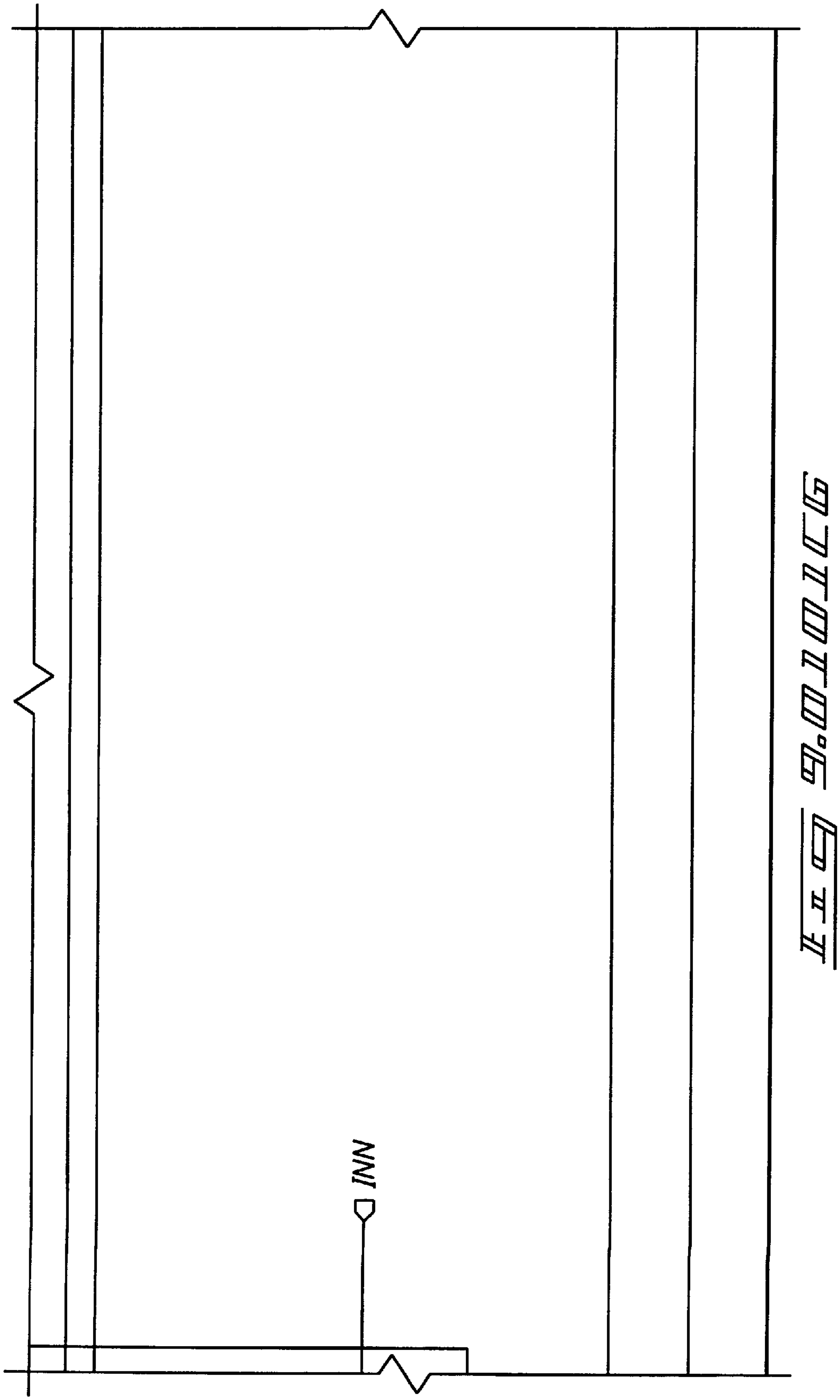
FIG. 9.01.01LG

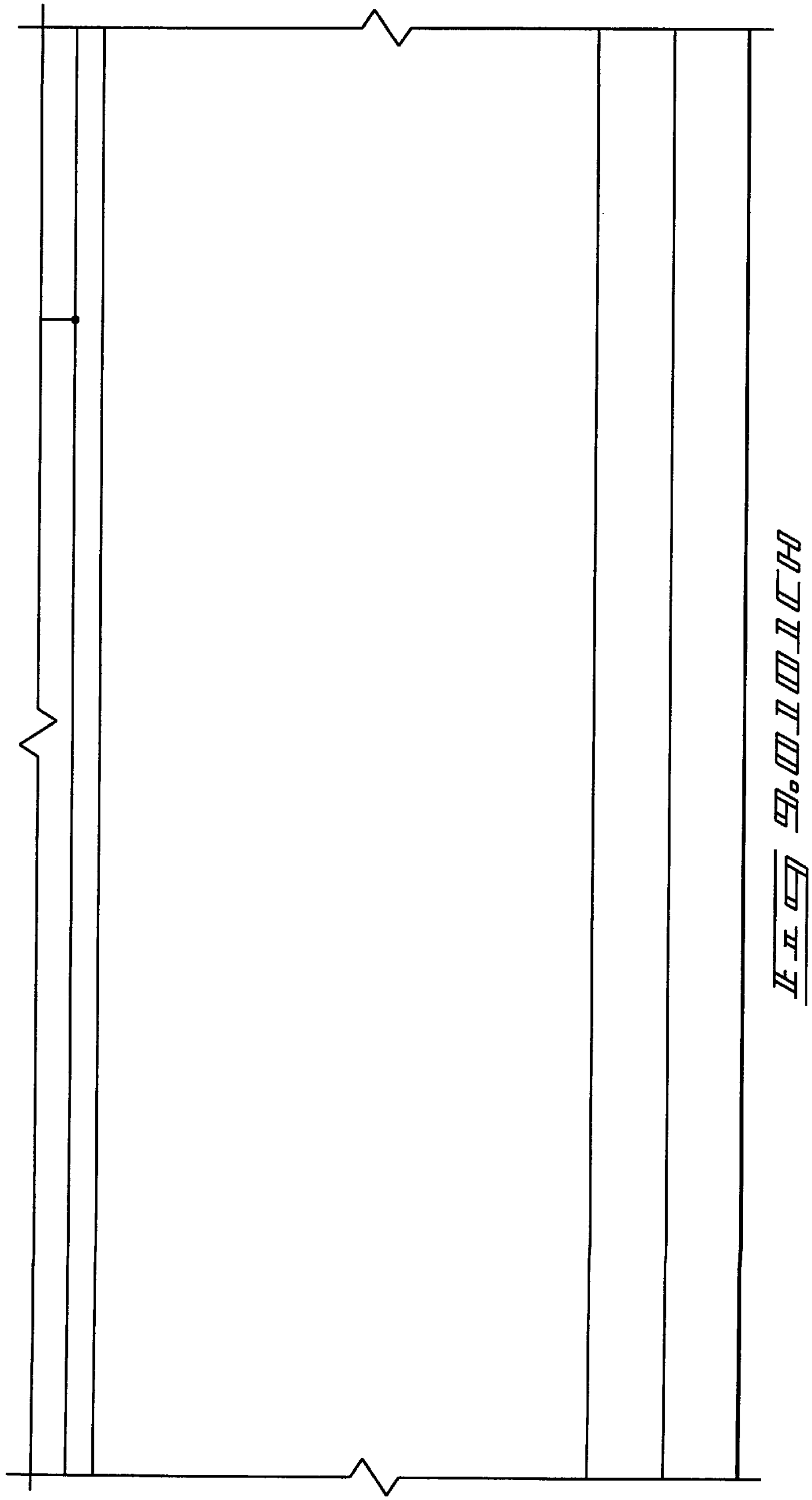
FIG. 9.010.7H

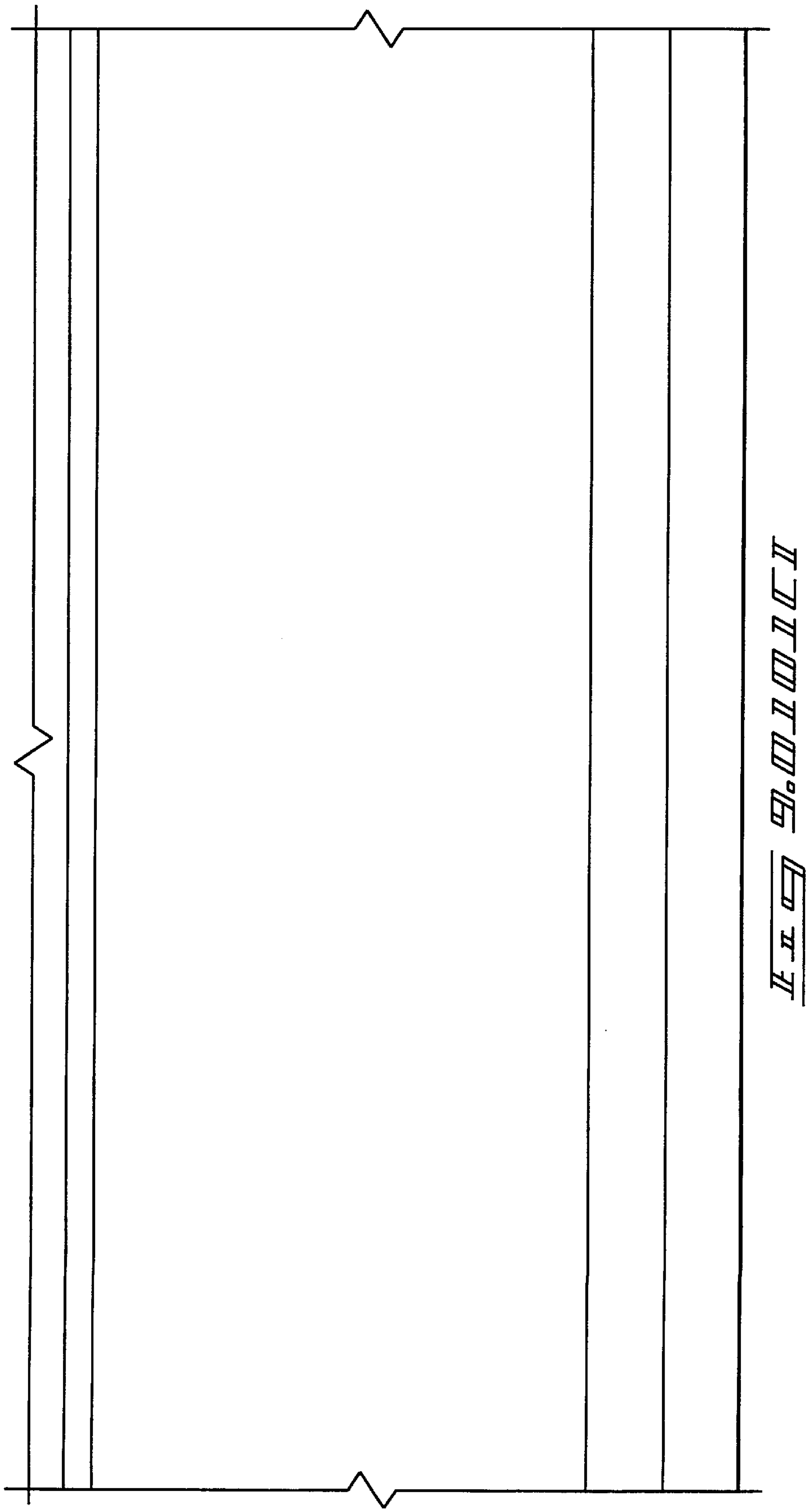
Fig. 9.010.11

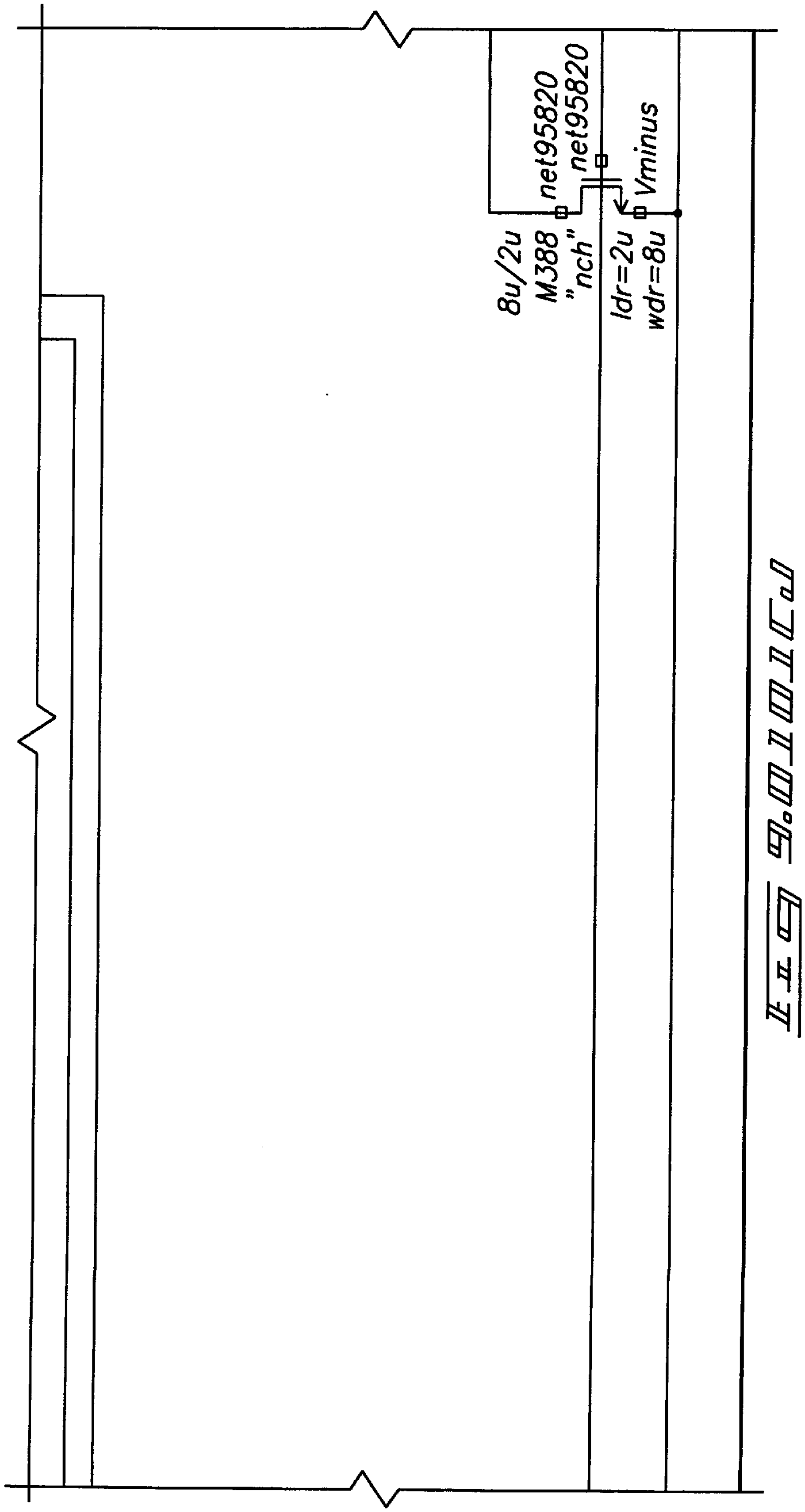
Fig. 9.0101(d)

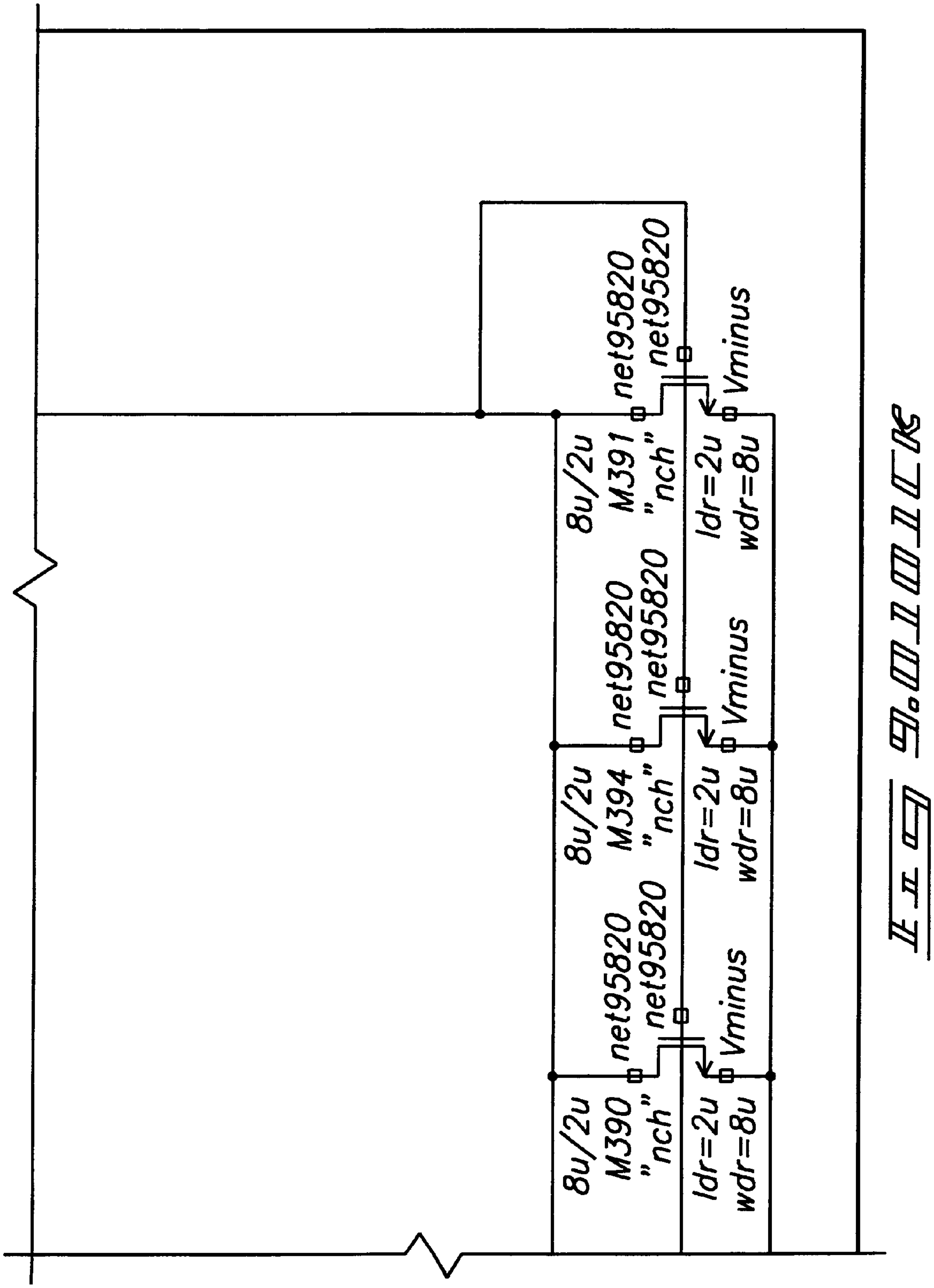
FIG. 9.0101CK

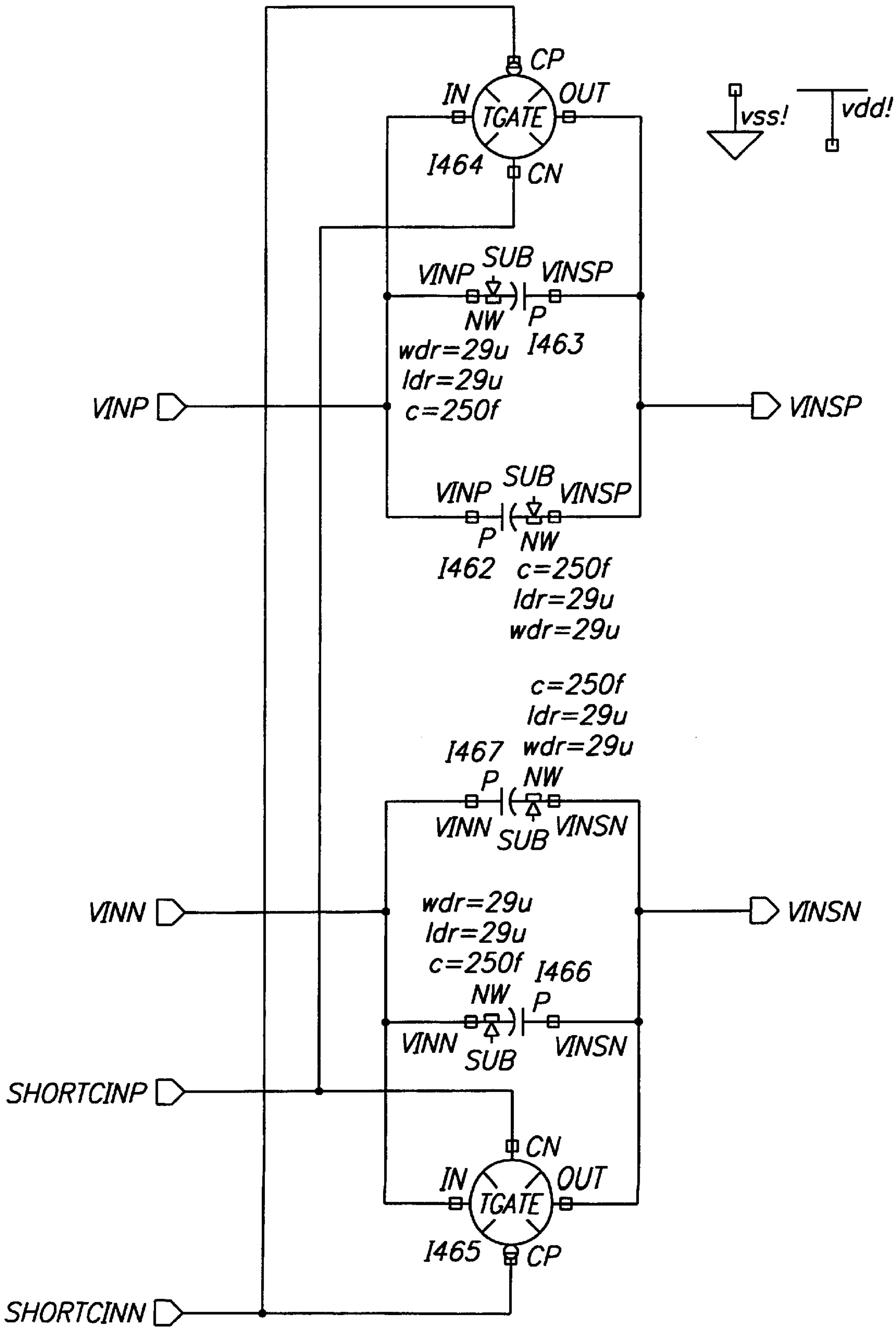
Fig 9.0102

| | | | | | | | | | | | | | | | |
|---|---|---|---|---|---|---|---|---|---|---|---|---|---|---|---|
| | | | | | | | | | 9.0103AJ | 9.0103AK | 9.0103AL | 9.0103AM | 9.0103AN | 9.0103AO | 9.0103AP |
| 9.0103BA | 9.0103BB | 9.0103BC | 9.0103BD | 9.0103BE | 9.0103BF | 9.0103BG | 9.0103BH | | 9.0103BJ | 9.0103BK | 9.0103BL | 9.0103BM | 9.0103BN | 9.0103BO | 9.0103BP |
| 9.0103CA | 9.0103CB | 9.0103CC | 9.0103CD | 9.0103CE | 9.0103CF | 9.0103CG | 9.0103CH | 9.0103CI | 9.0103CJ | 9.0103CK | 9.0103CL | 9.0103CM | 9.0103CN | 9.0103CO | 9.0103CP |
| 9.0103DA | 9.0103DB | 9.0103DC | 9.0103DD | 9.0103DE | 9.0103DF | 9.0103DG | 9.0103DH | 9.0103DI | 9.0103DJ | 9.0103DK | 9.0103DL | 9.0103DM | 9.0103DN | 9.0103DO | 9.0103DP |
| 9.0103EA | 9.0103EB | 9.0103EC | 9.0103ED | 9.0103EE | 9.0103EF | 9.0103EG | 9.0103EH | 9.0103EI | 9.0103EJ | 9.0103EK | 9.0103EL | 9.0103EM | 9.0103EN | 9.0103EO | 9.0103EP |
| 9.0103FA | 9.0103FB | 9.0103FC | 9.0103FD | 9.0103FE | 9.0103FF | 9.0103FG | 9.0103FH | 9.0103FI | 9.0103FJ | 9.0103FK | 9.0103FL | 9.0103FM | 9.0103FN | 9.0103FO | 9.0103FP |

Fig 9.0103

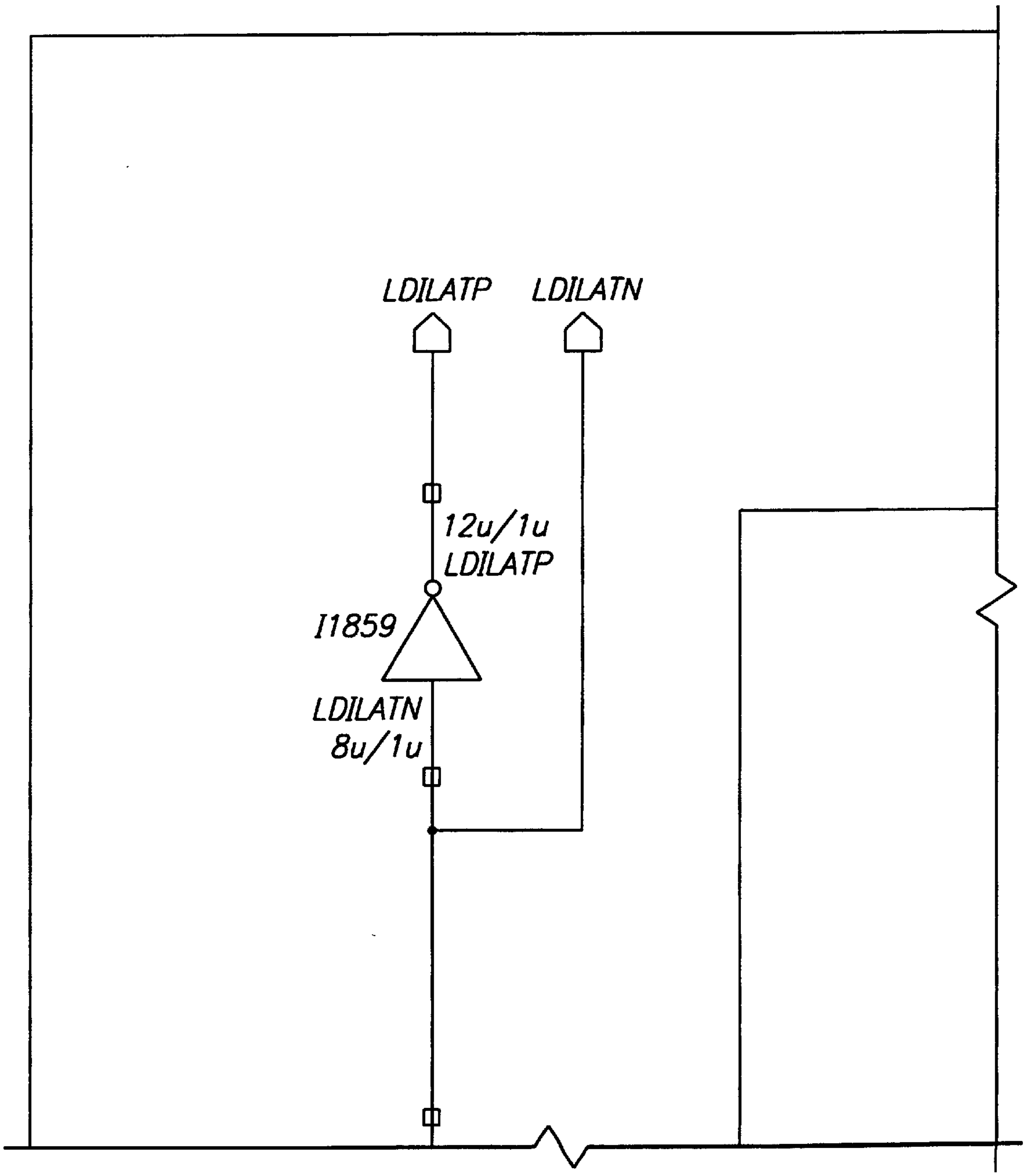
Fig 9.0103AJ

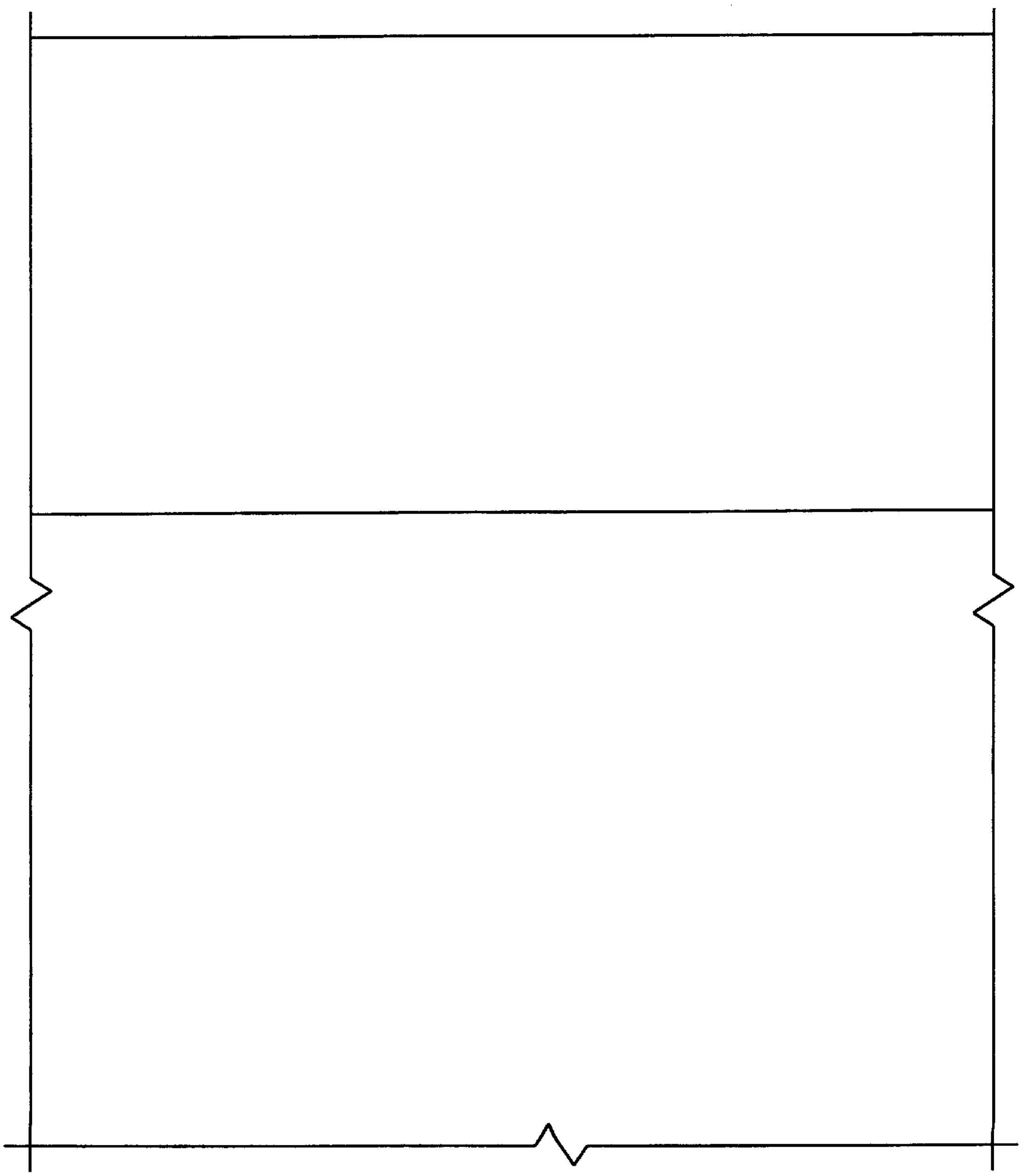
Fig 9.0103AK

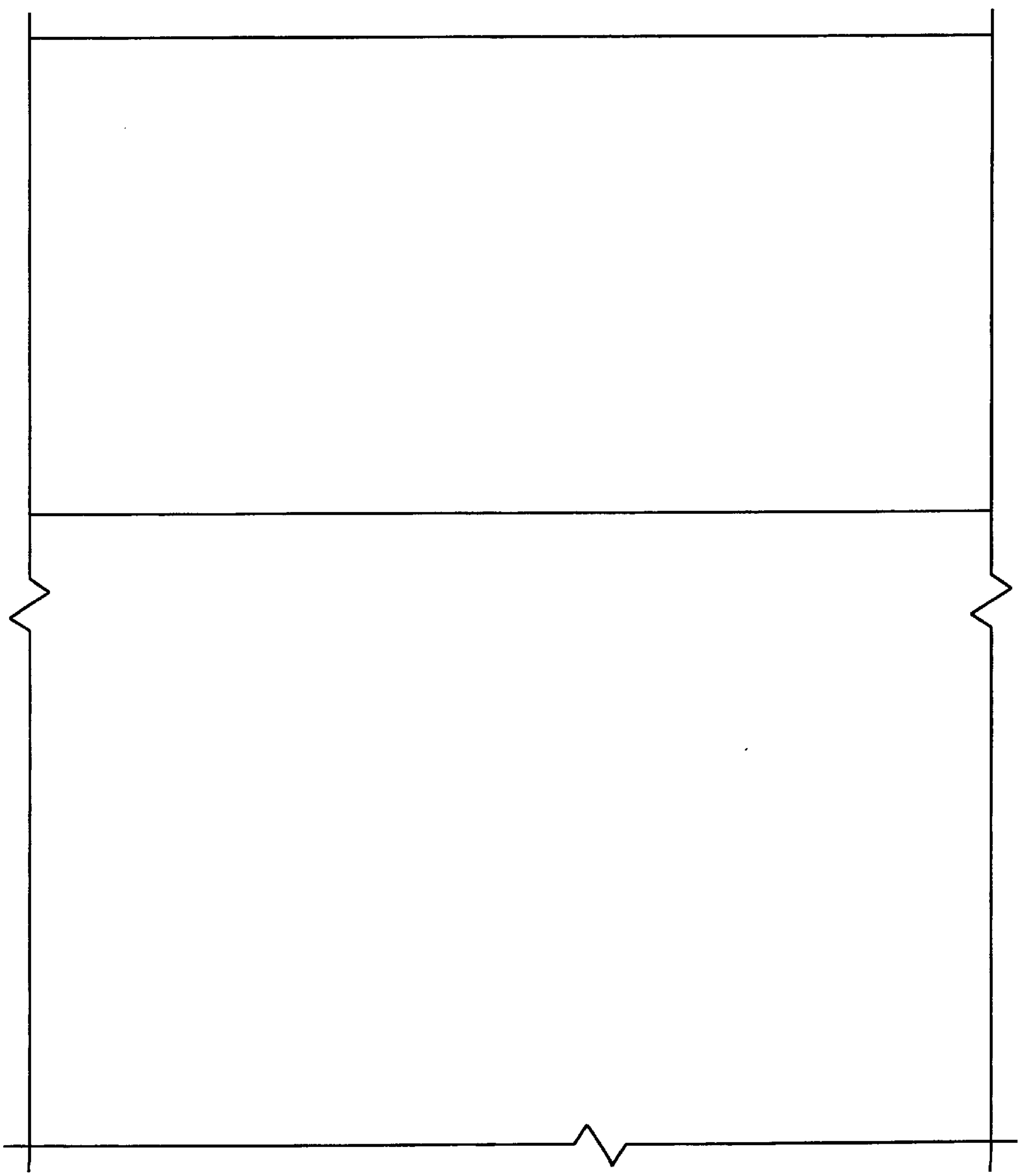
Fig 9.0103AL

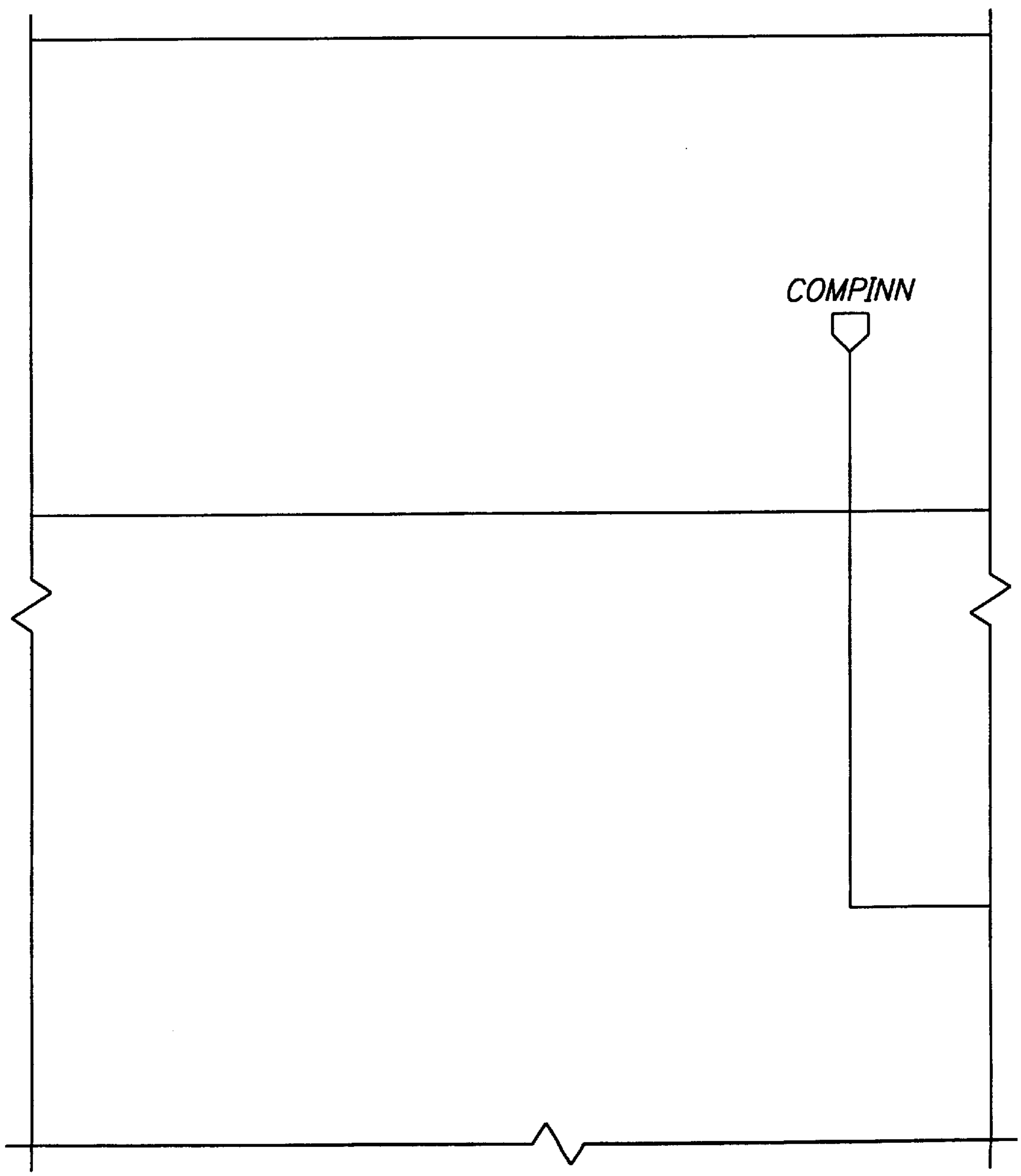
Fig 9.0103AM

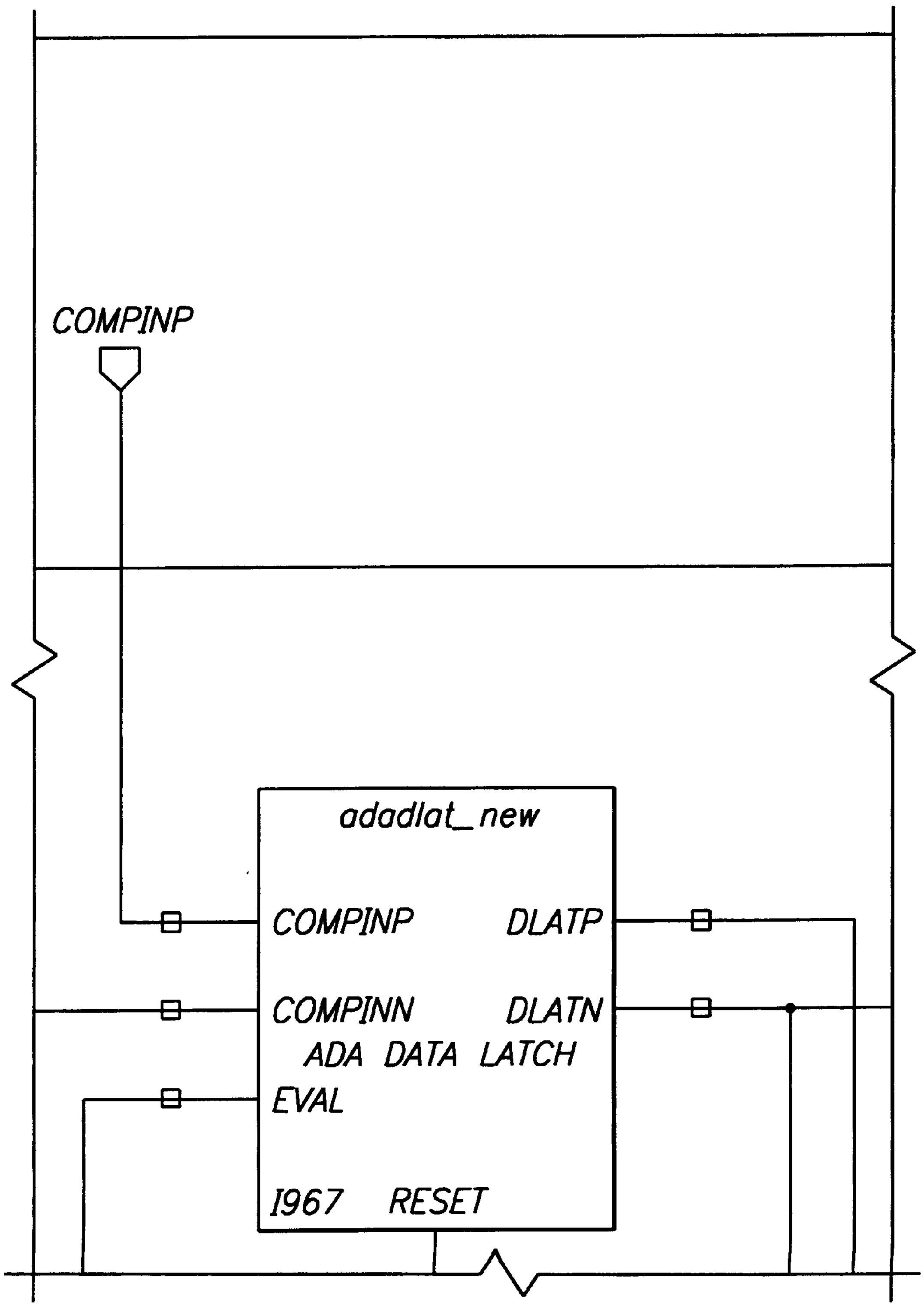
FIG 9.0103AN

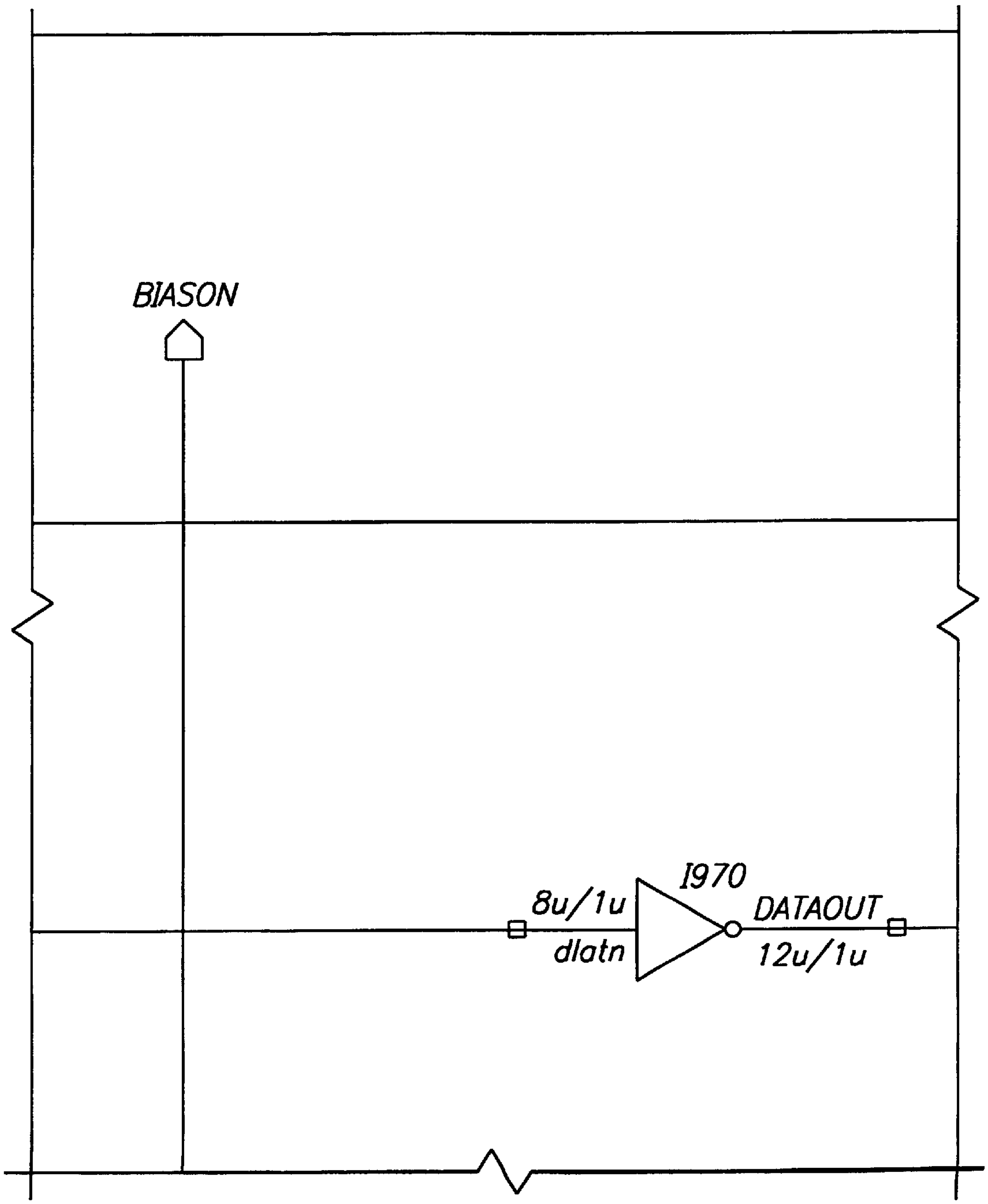
Fig 9.0103A0

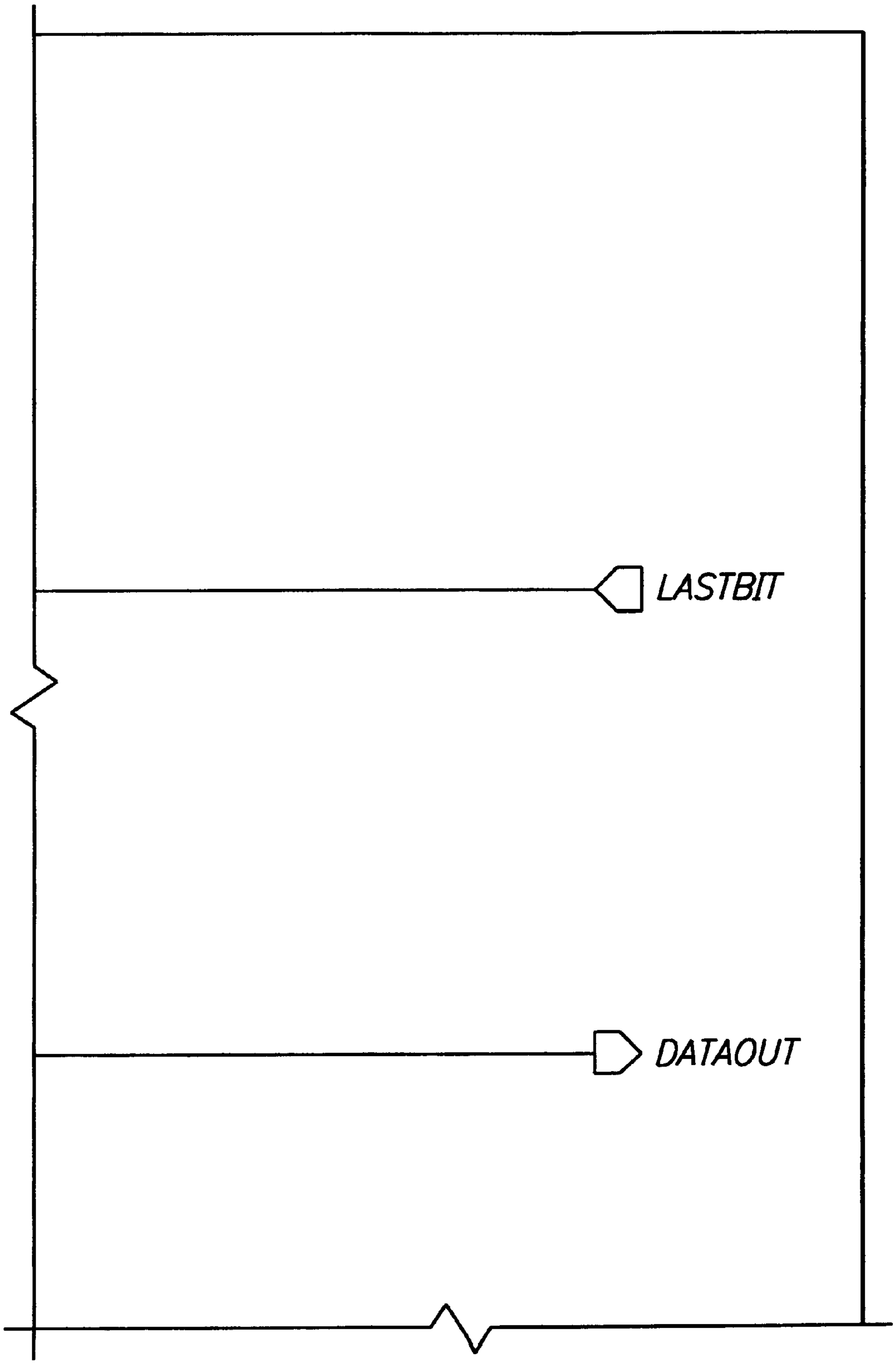
Fig 9.0103AP

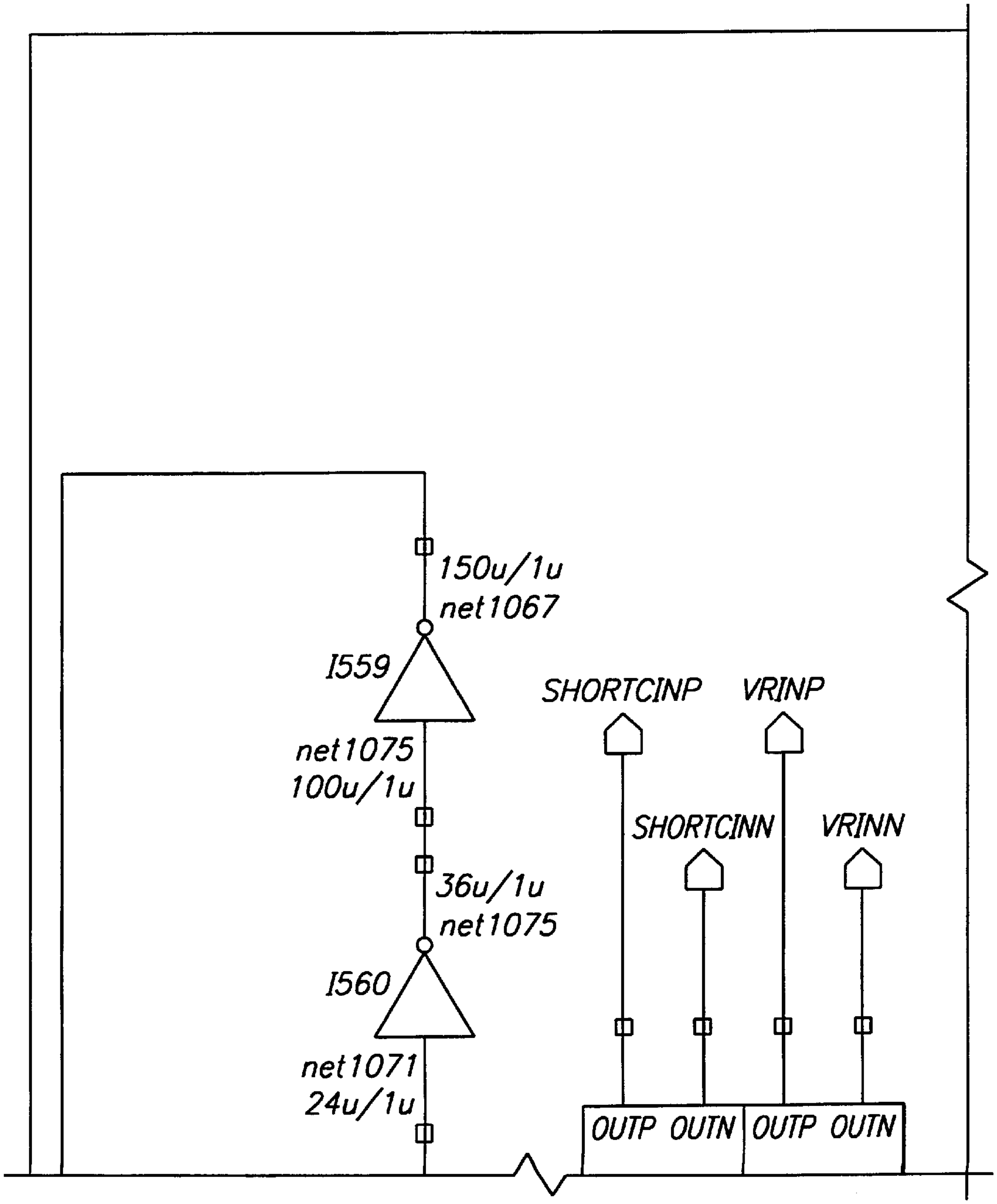
Fig. 9.0103BA

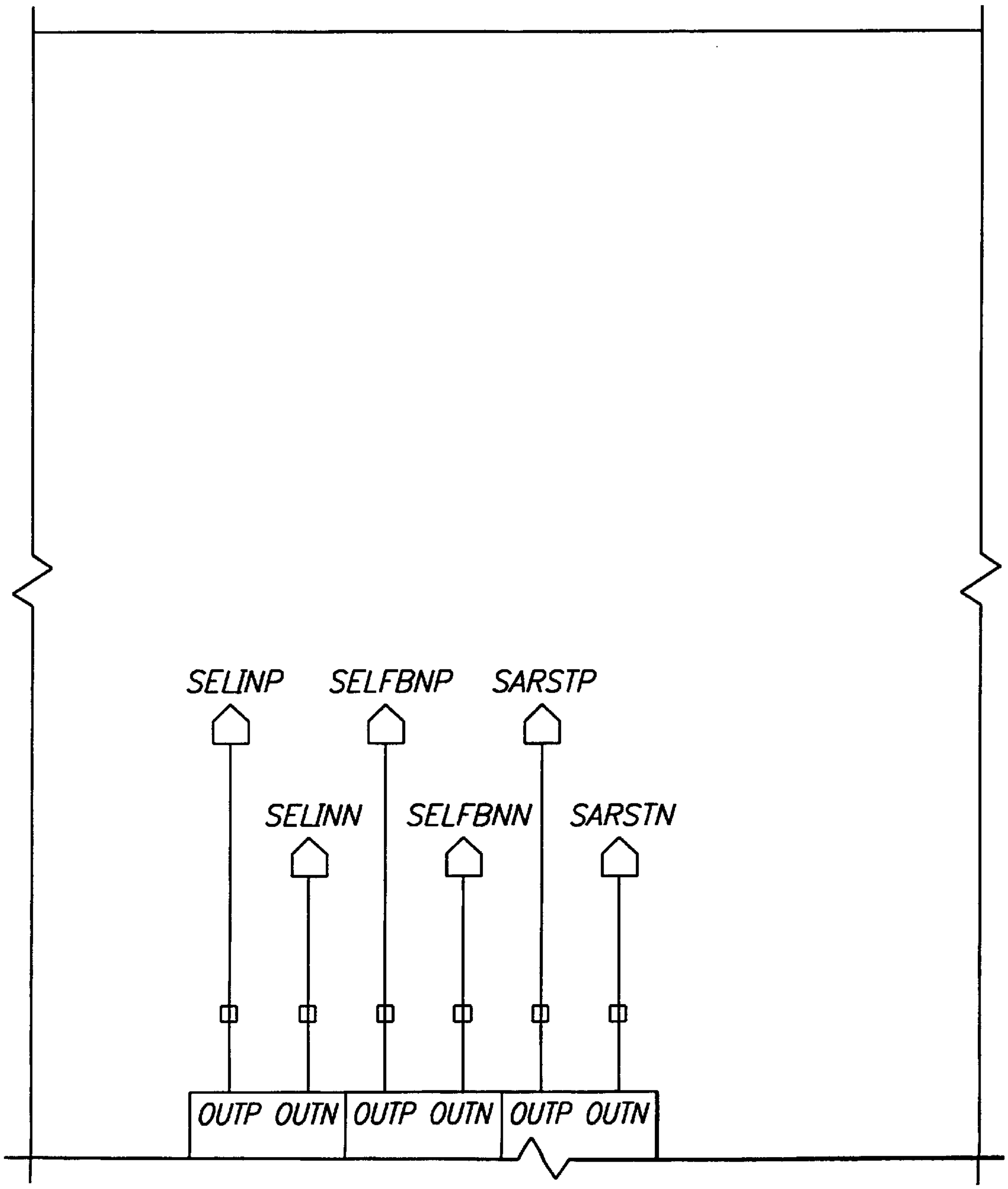
Fig 9.0103BB

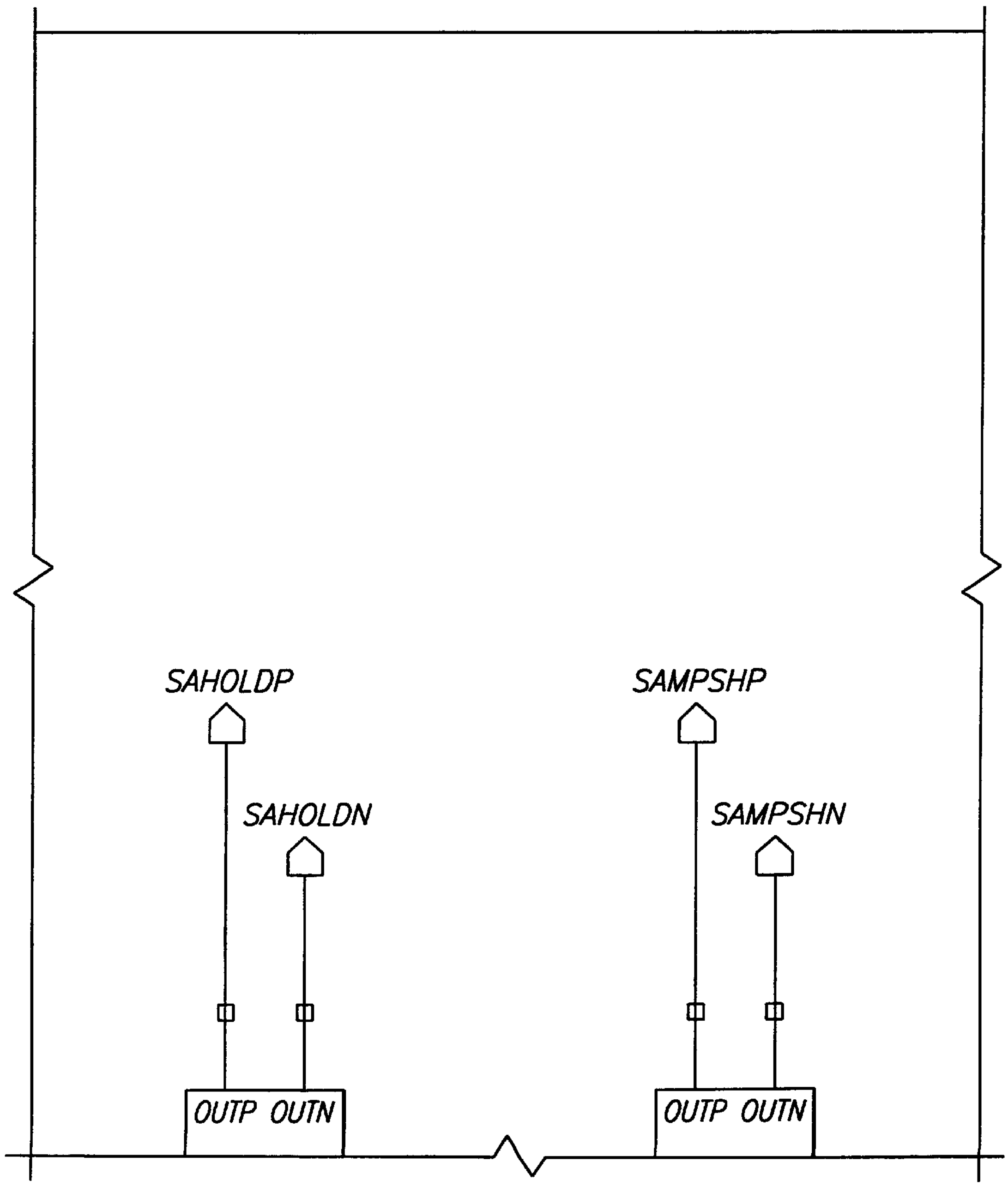
Fig 9.0103BC

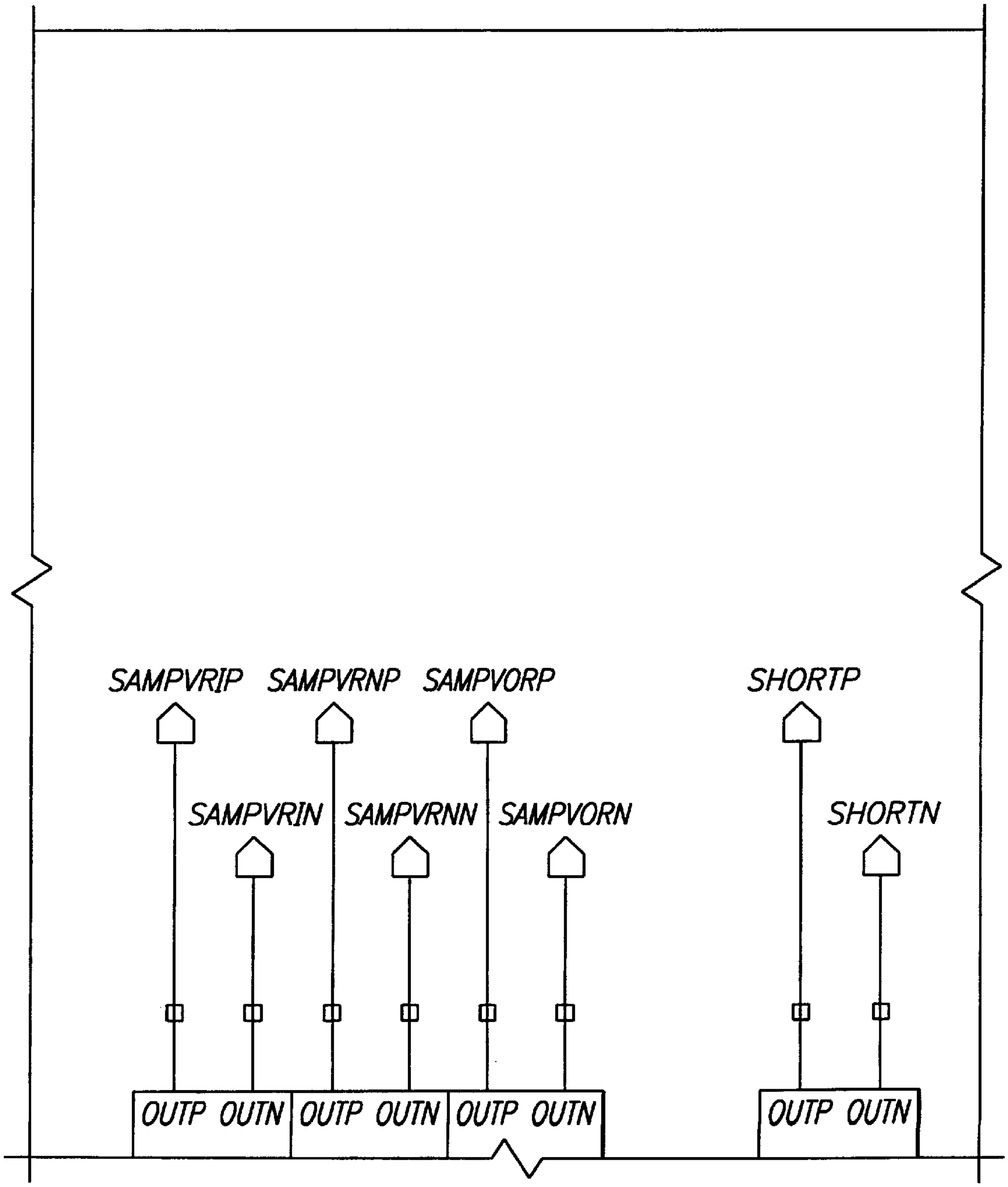
Fig. 9.0103BD

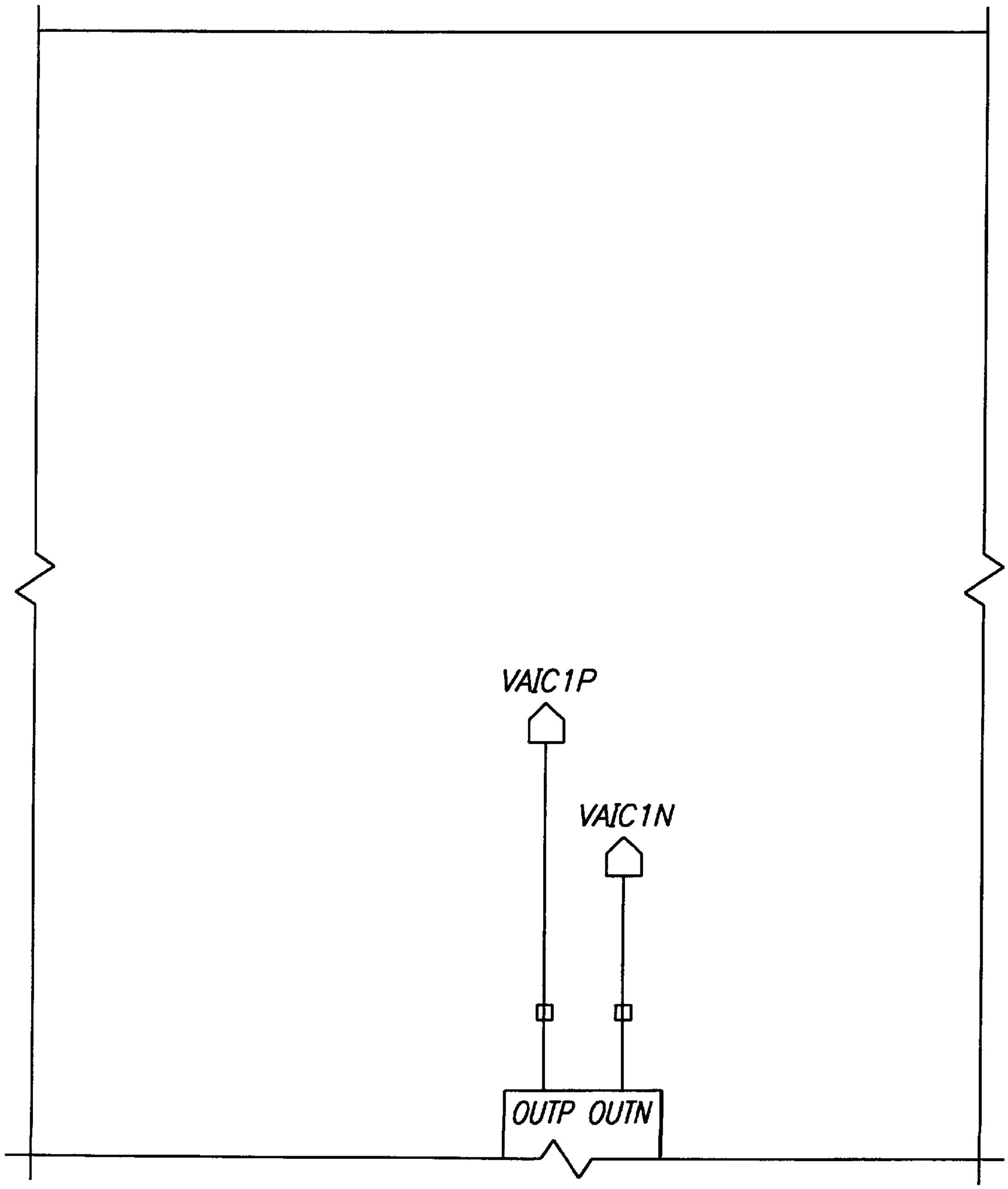
FIG. 9.0103BE

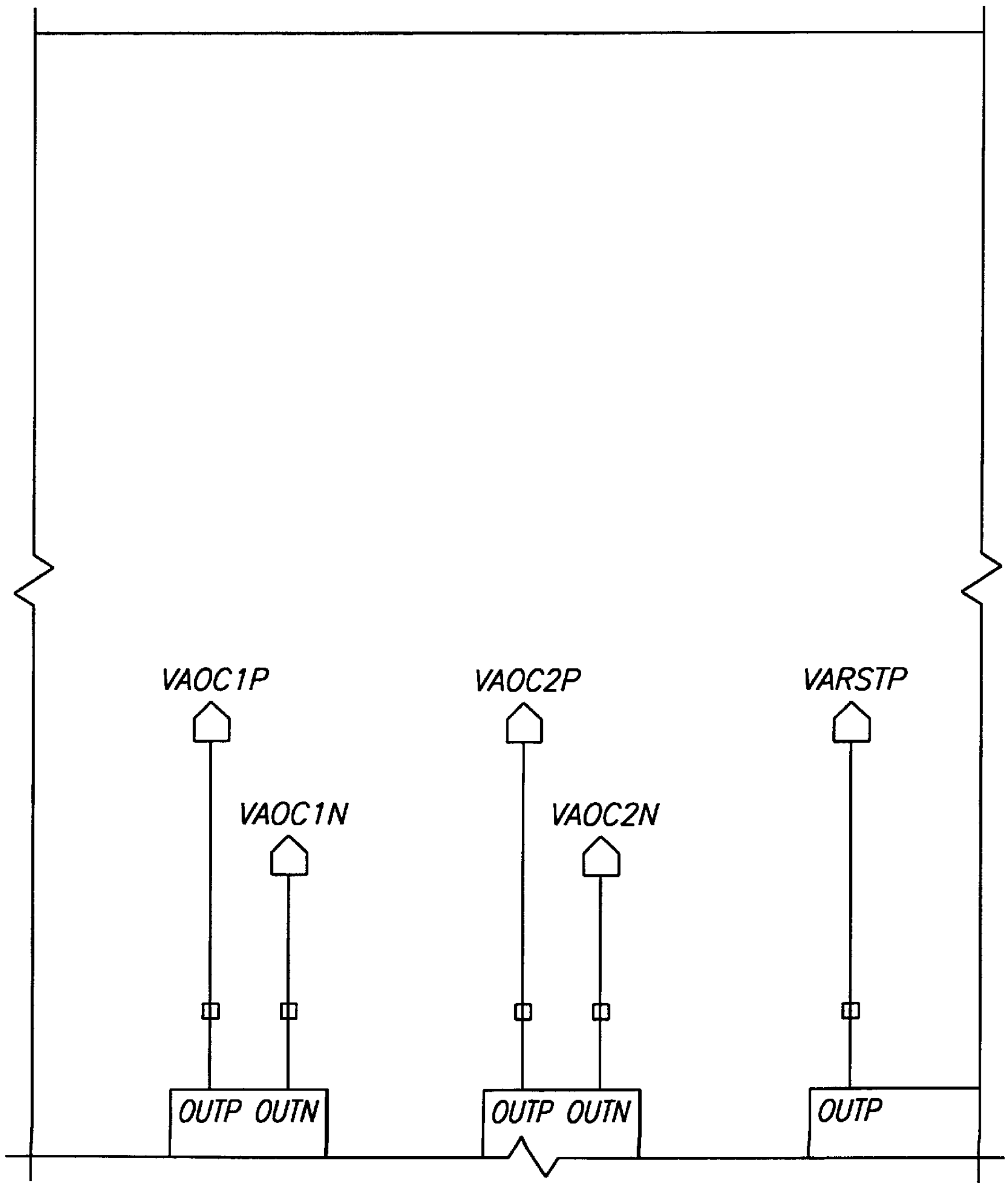
Fig 9.0103BF

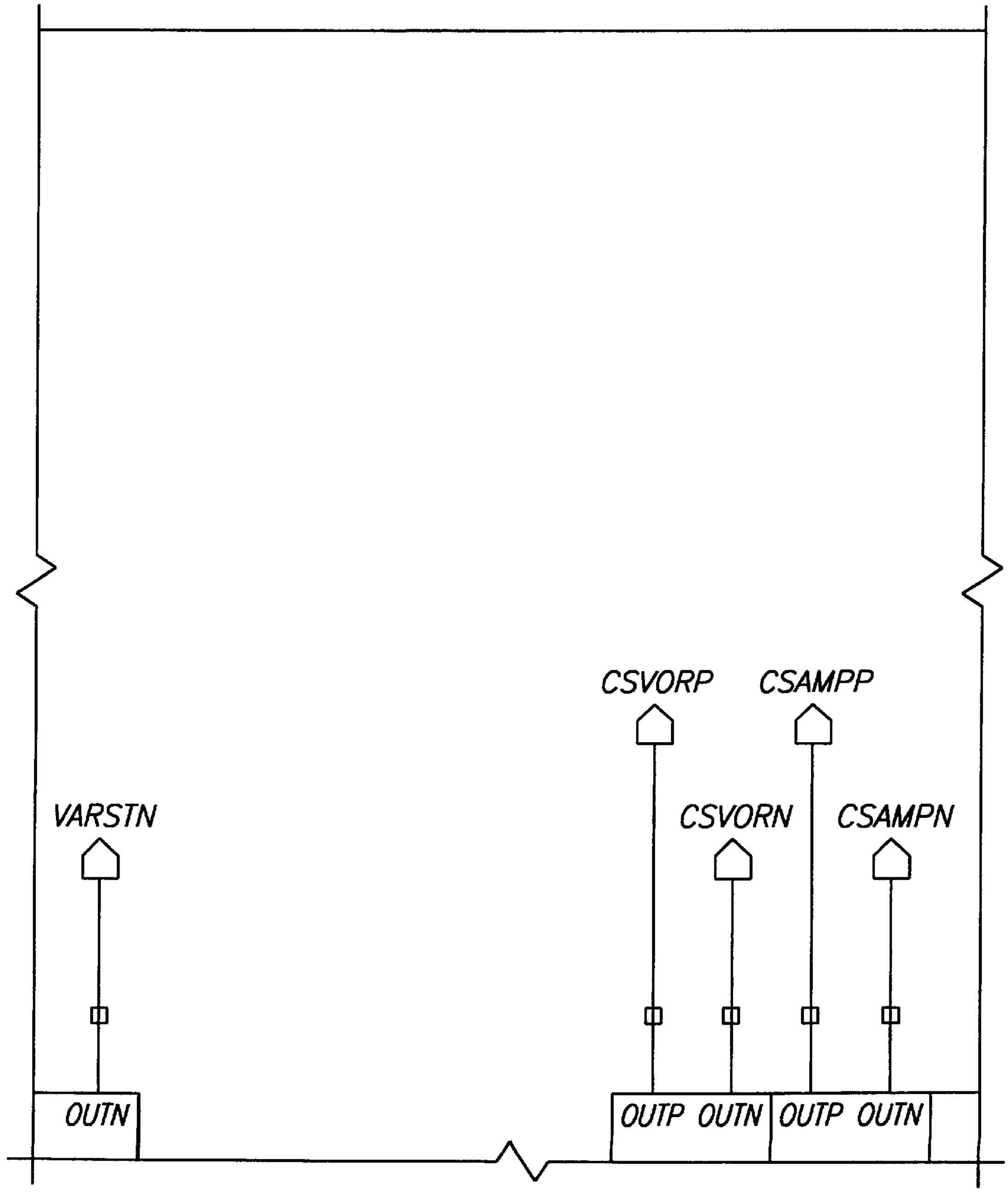
Fig 9.0103BG

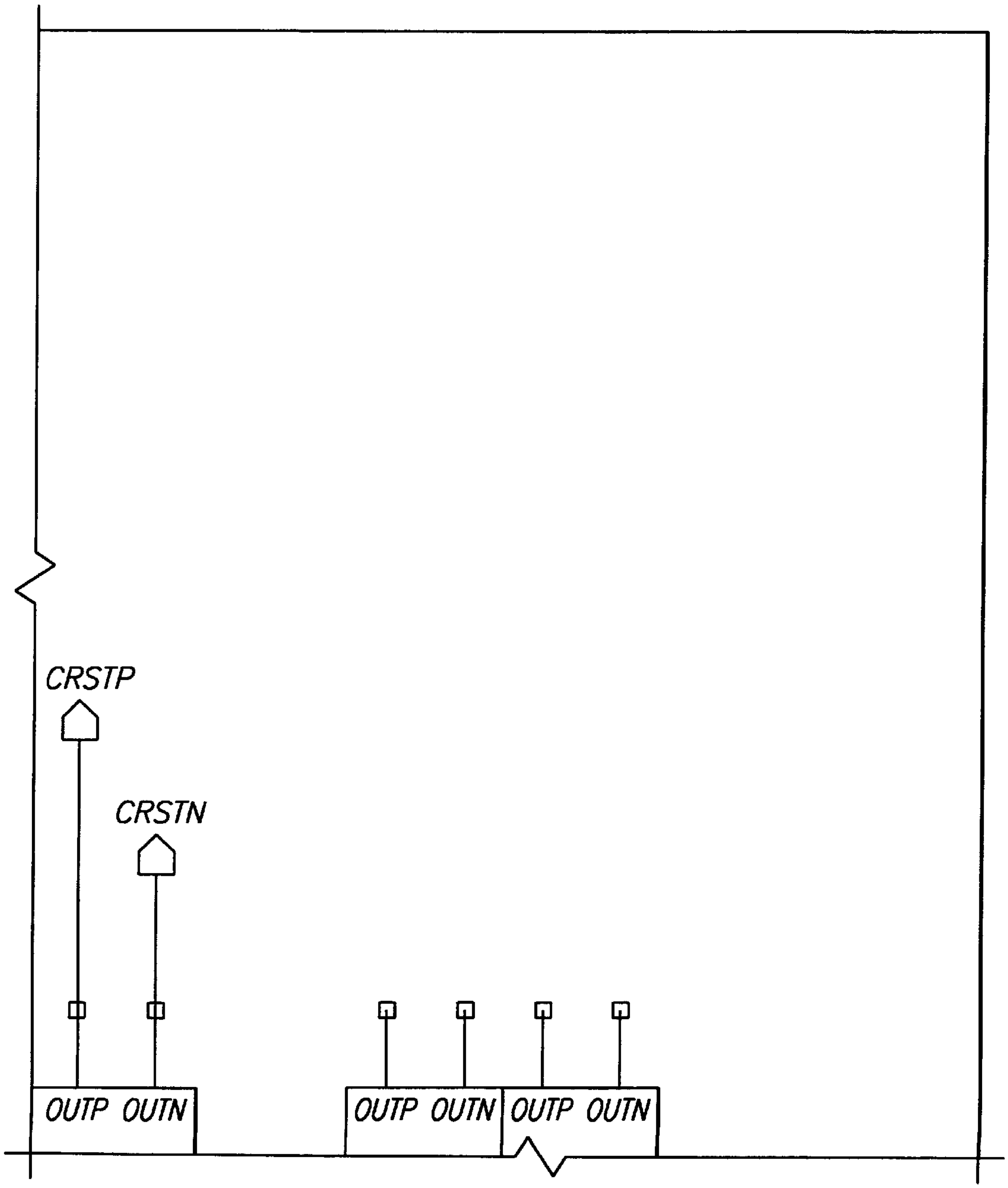
Fig 9.0103BH

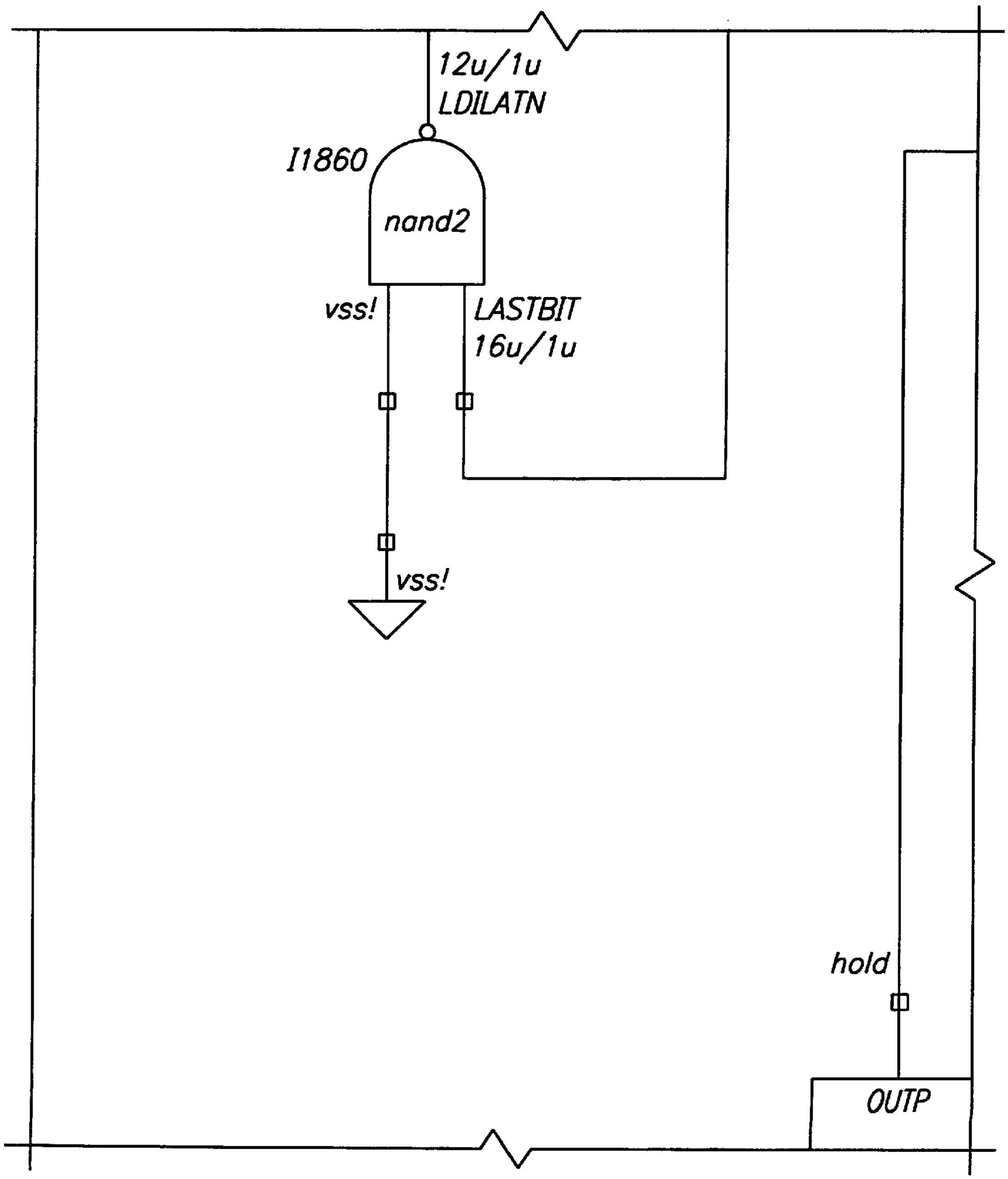
Fig 9.0103B.1

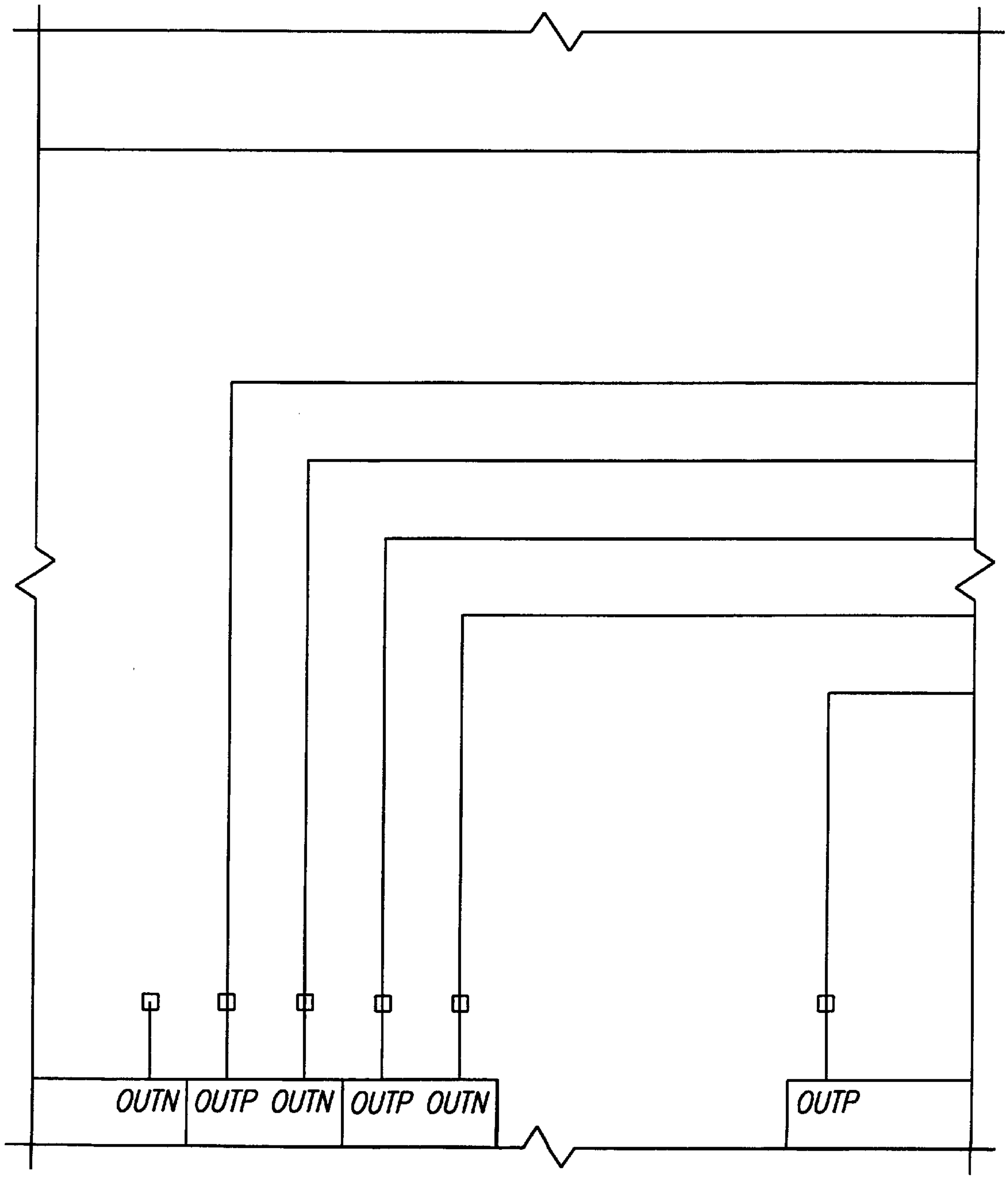
Fig 9.0103BK

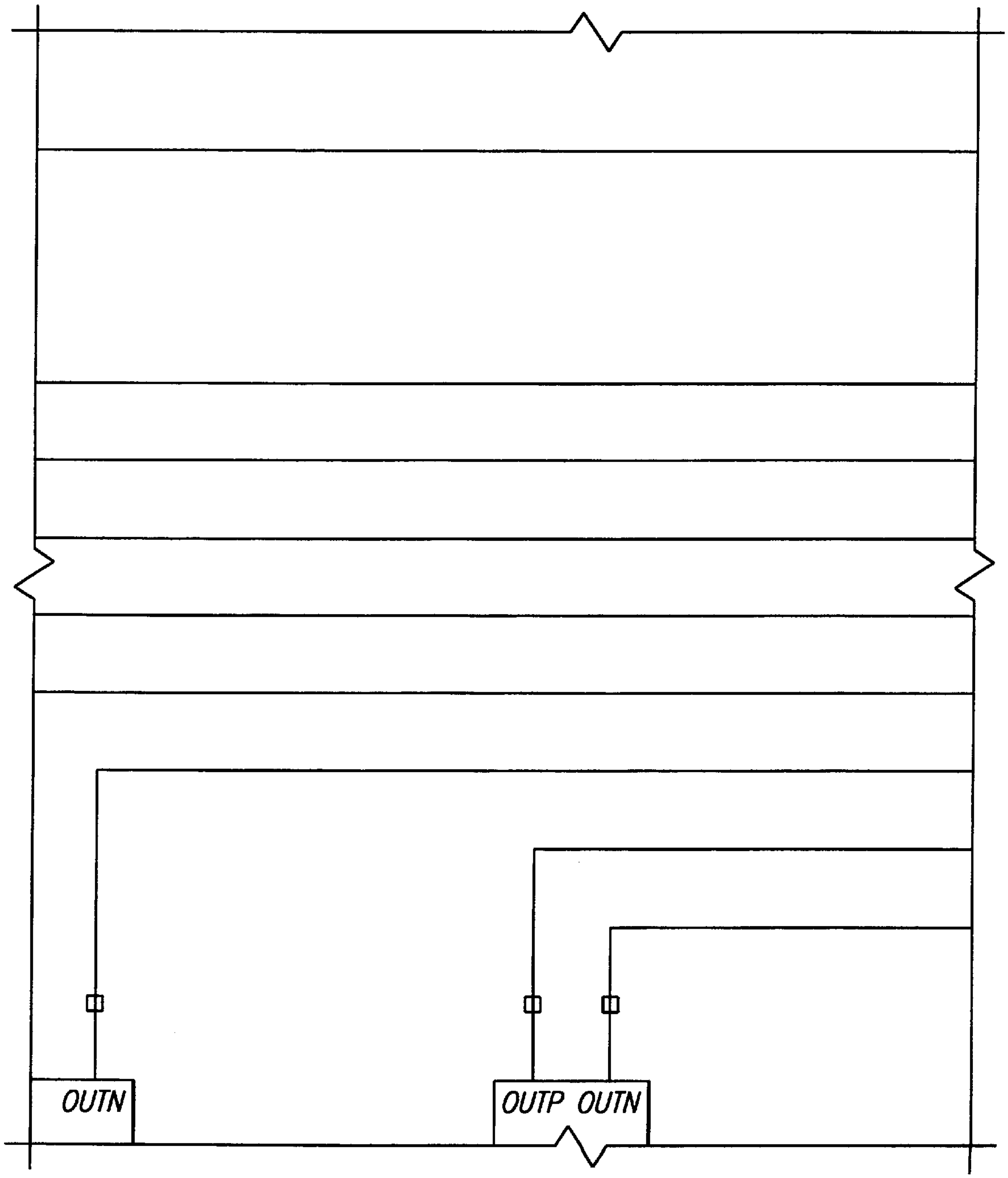
Fig 9.0103BL

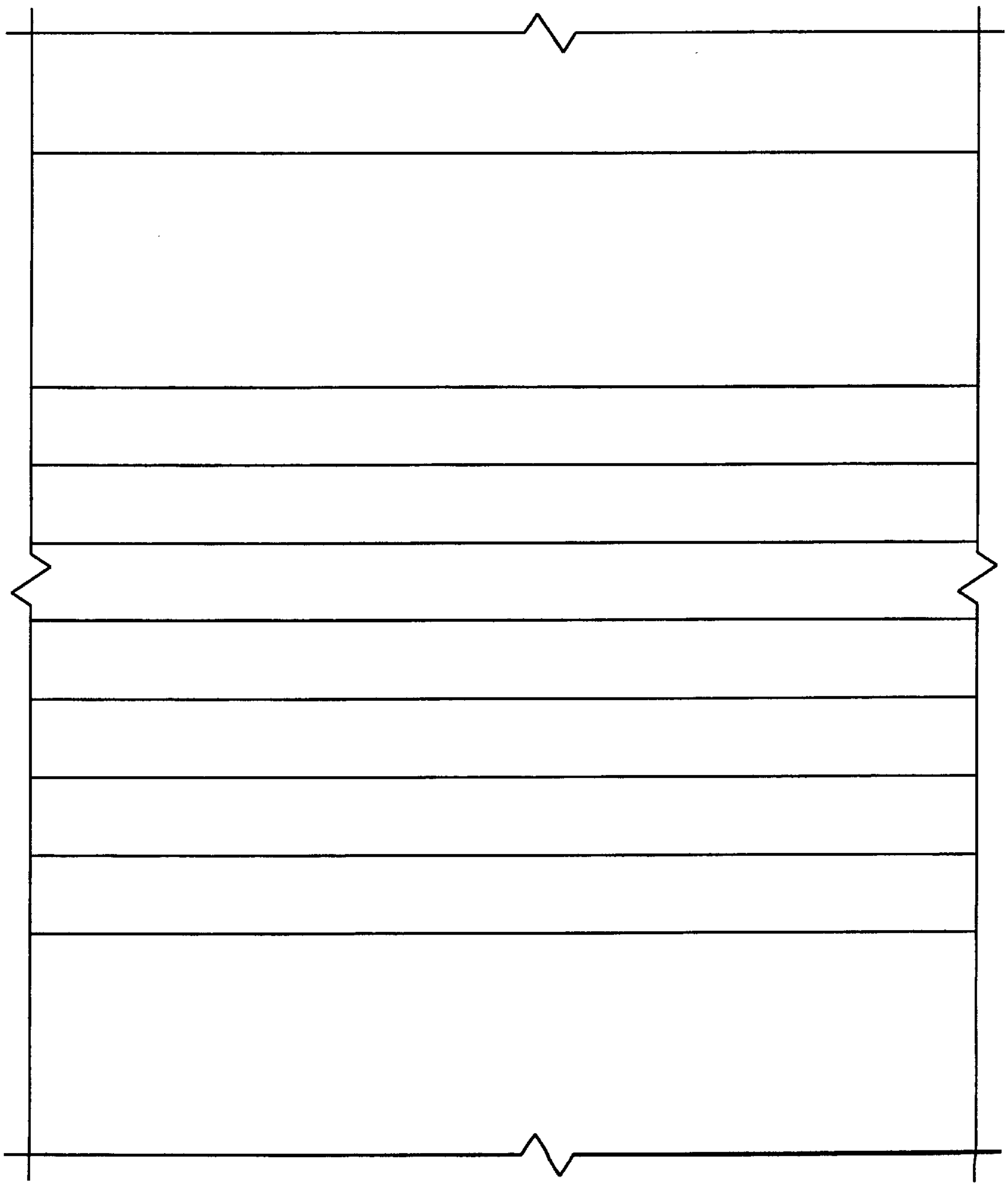
FIG 9.0103BM

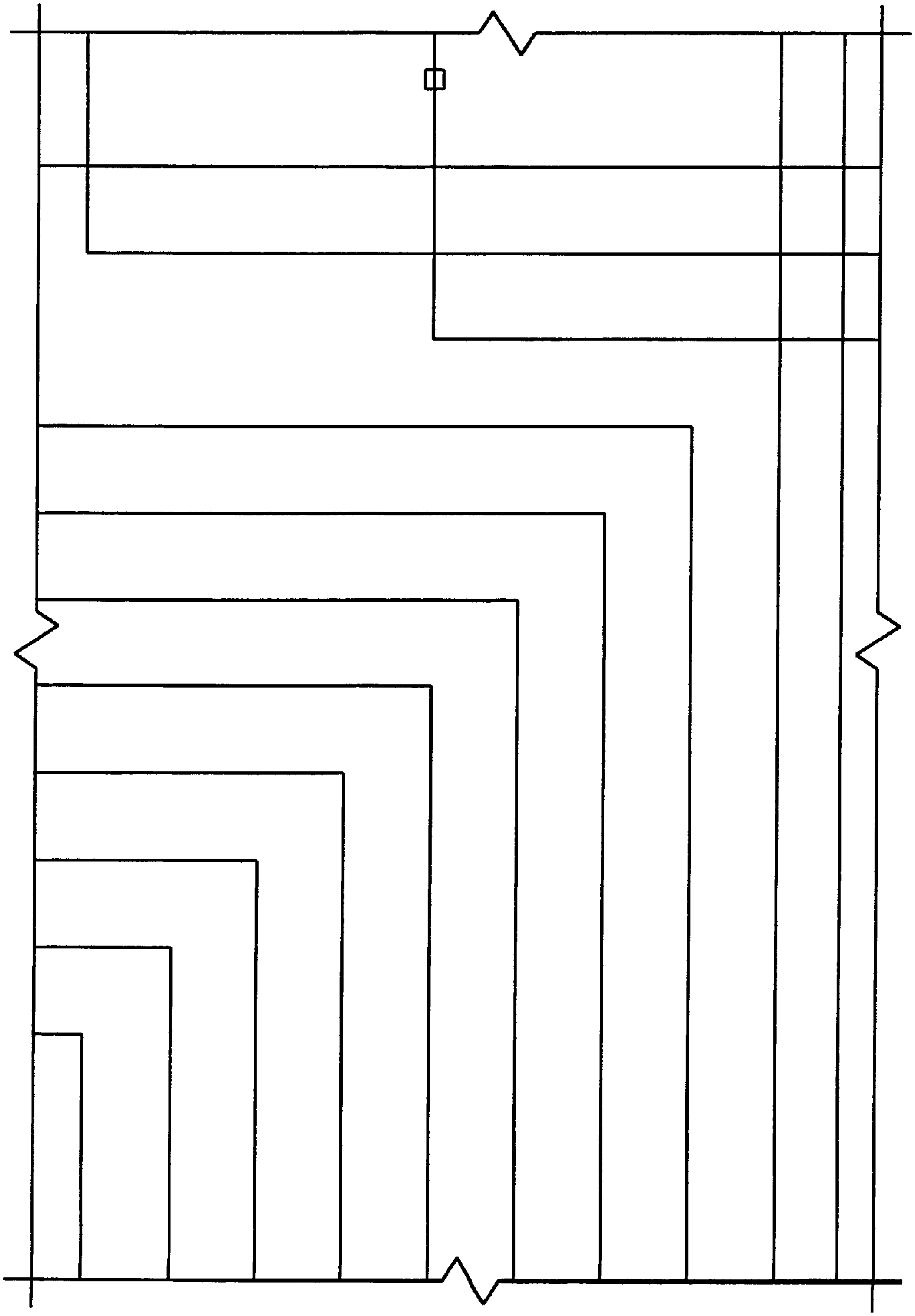
Fig 9.0103BN

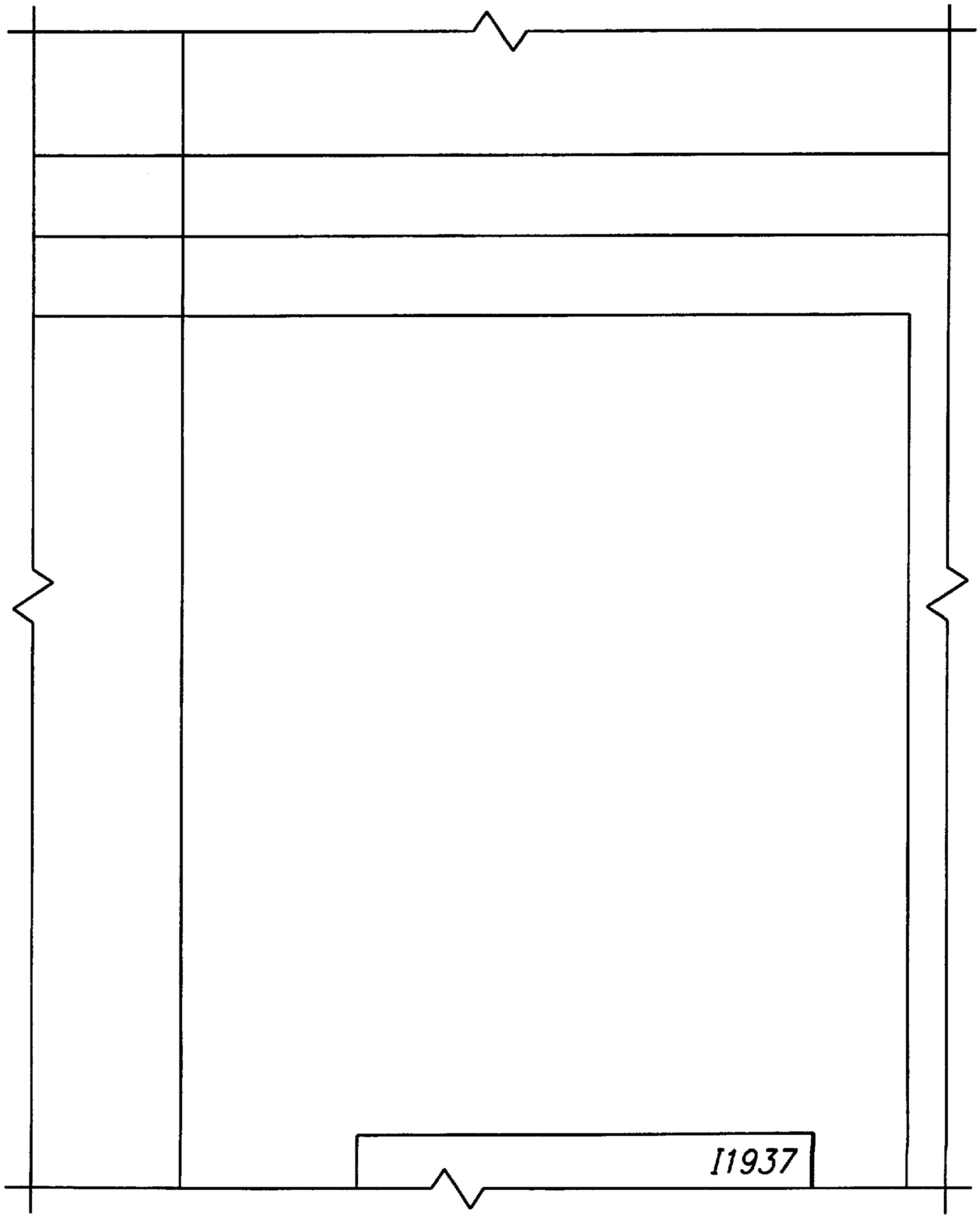
Fig. 9.0103B0

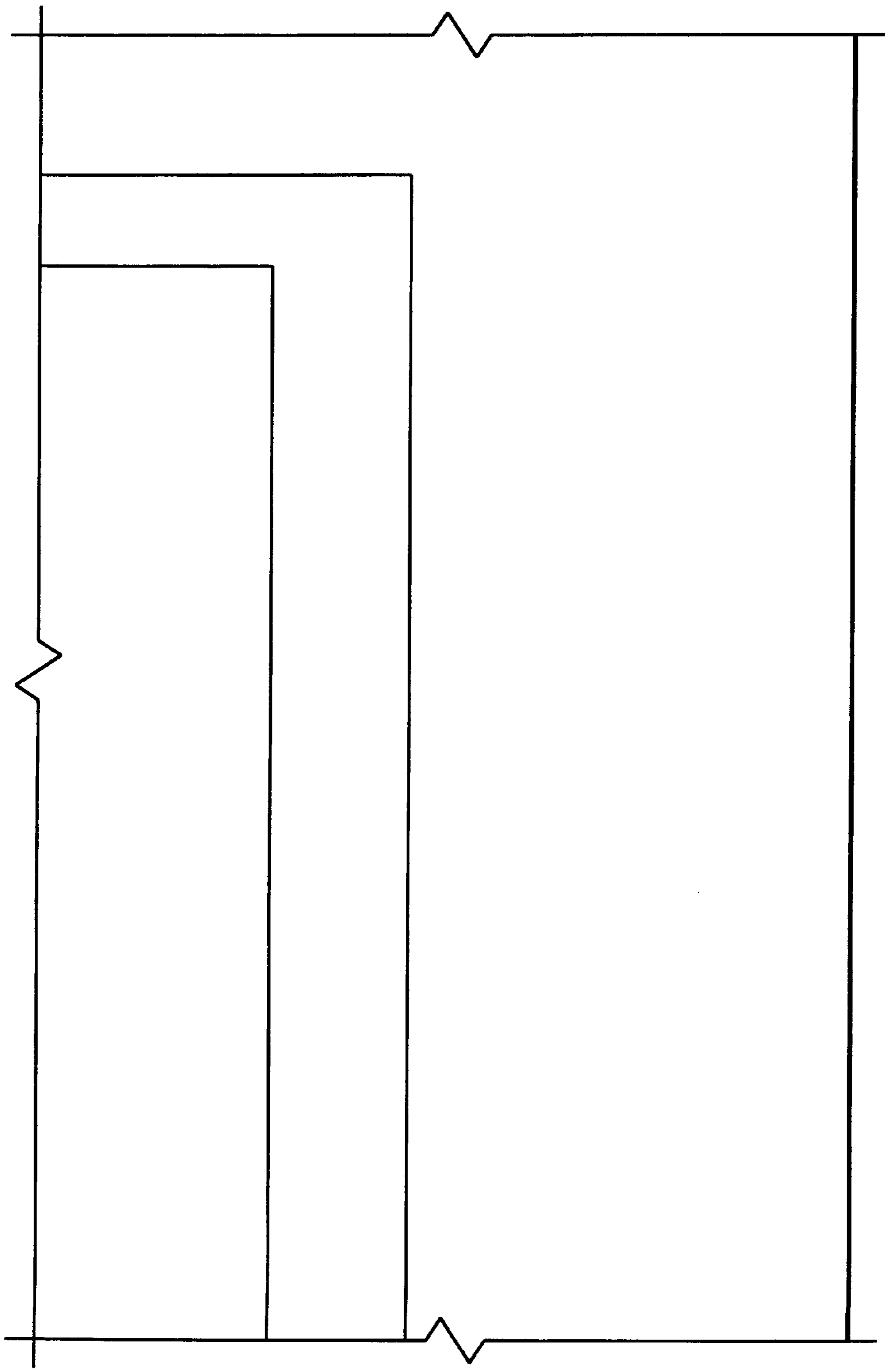
Fig 9.0103BP

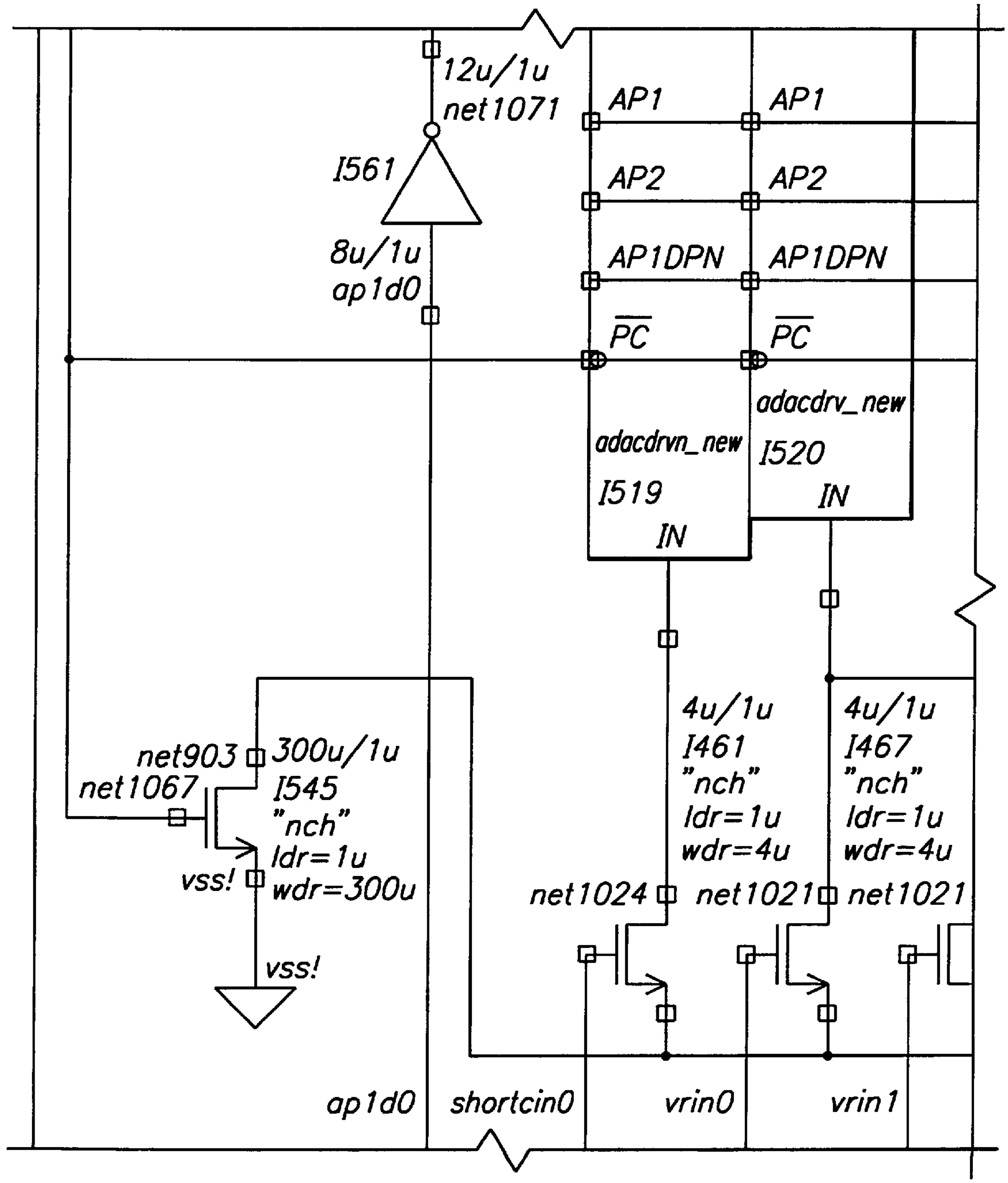
FIG. 9.0103CA

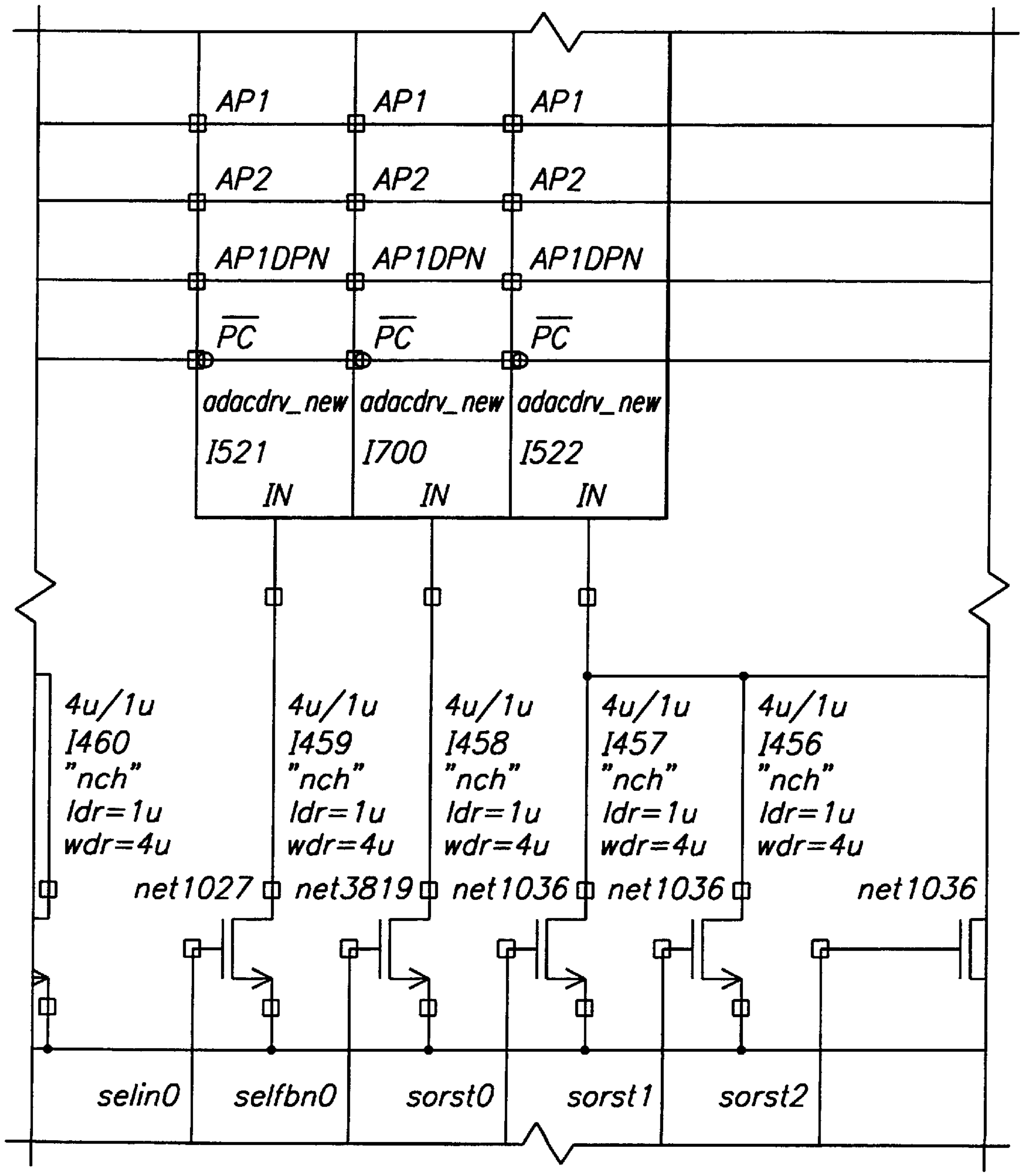
Fig 9.0103CB

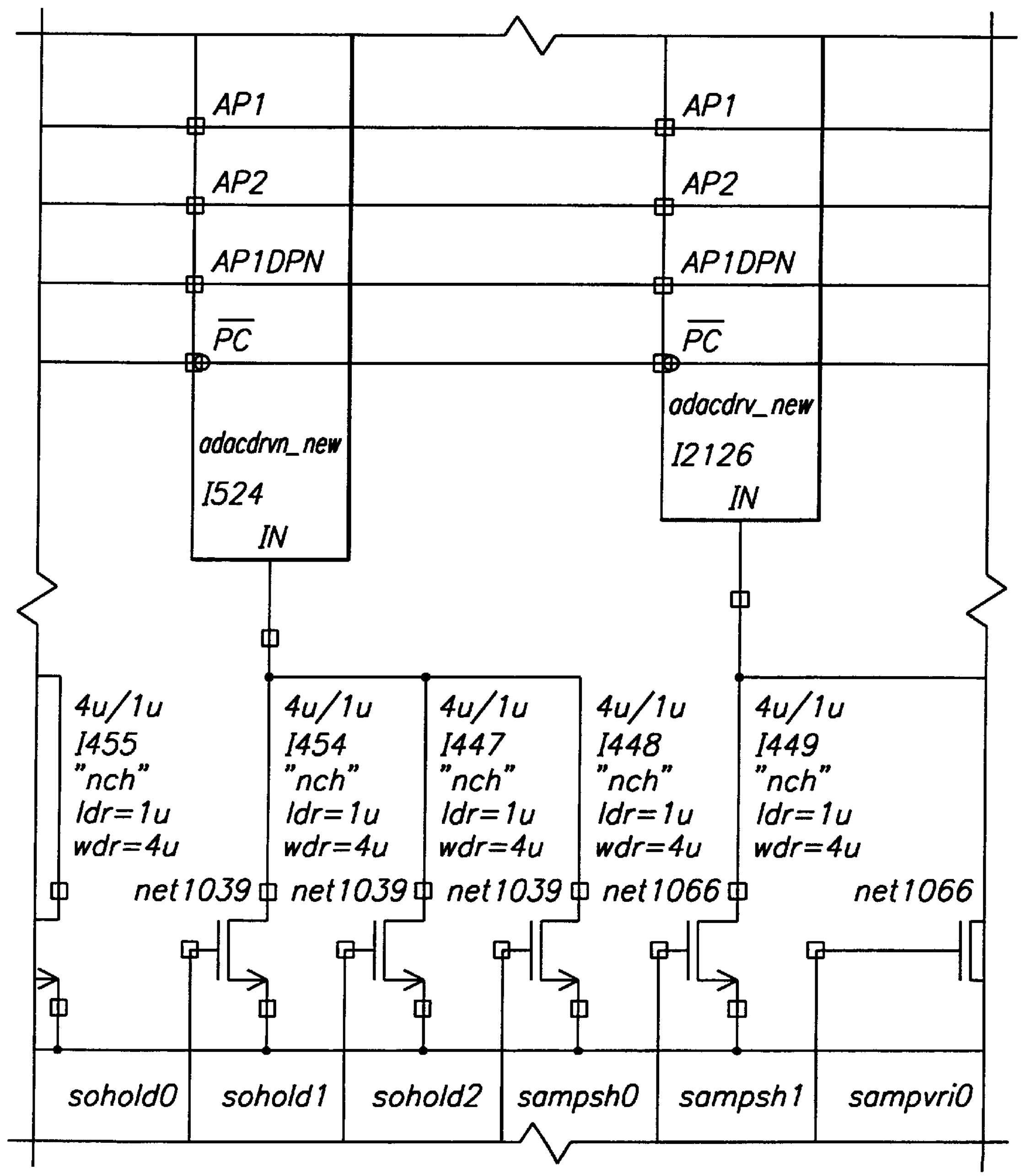
Fig. 9.0103CC

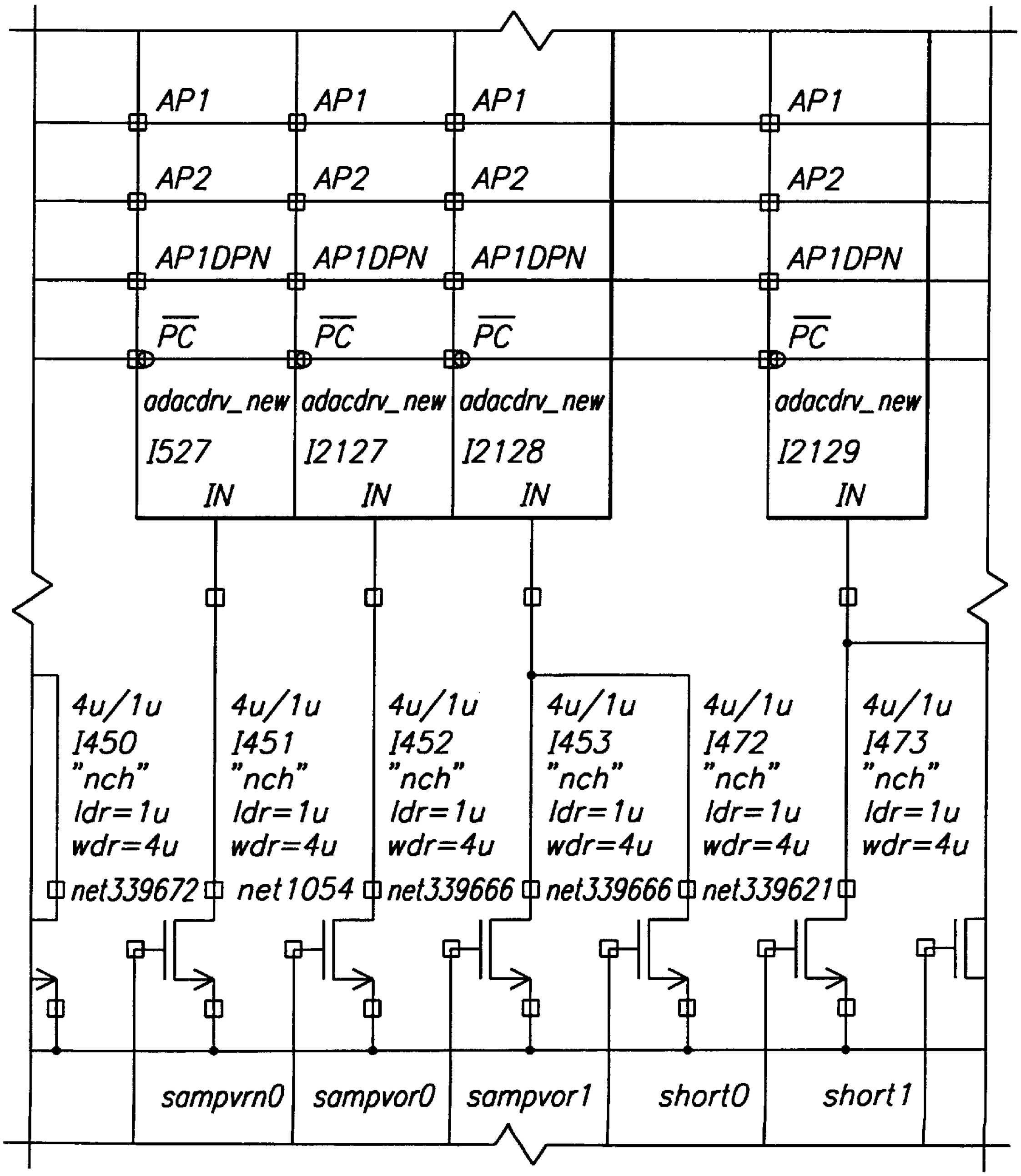
FIG 9.0103CD

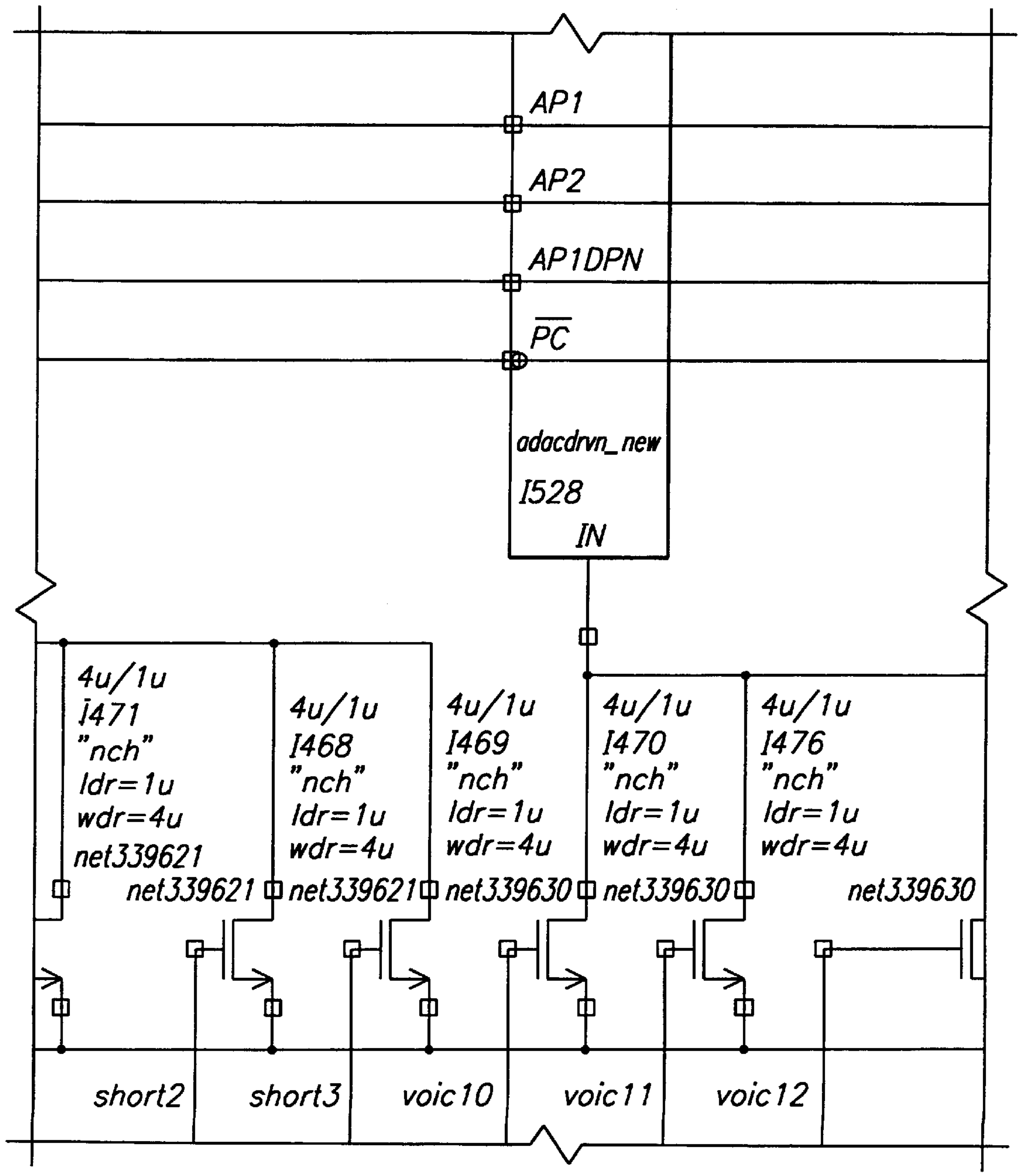
Fig. 9.0103CE

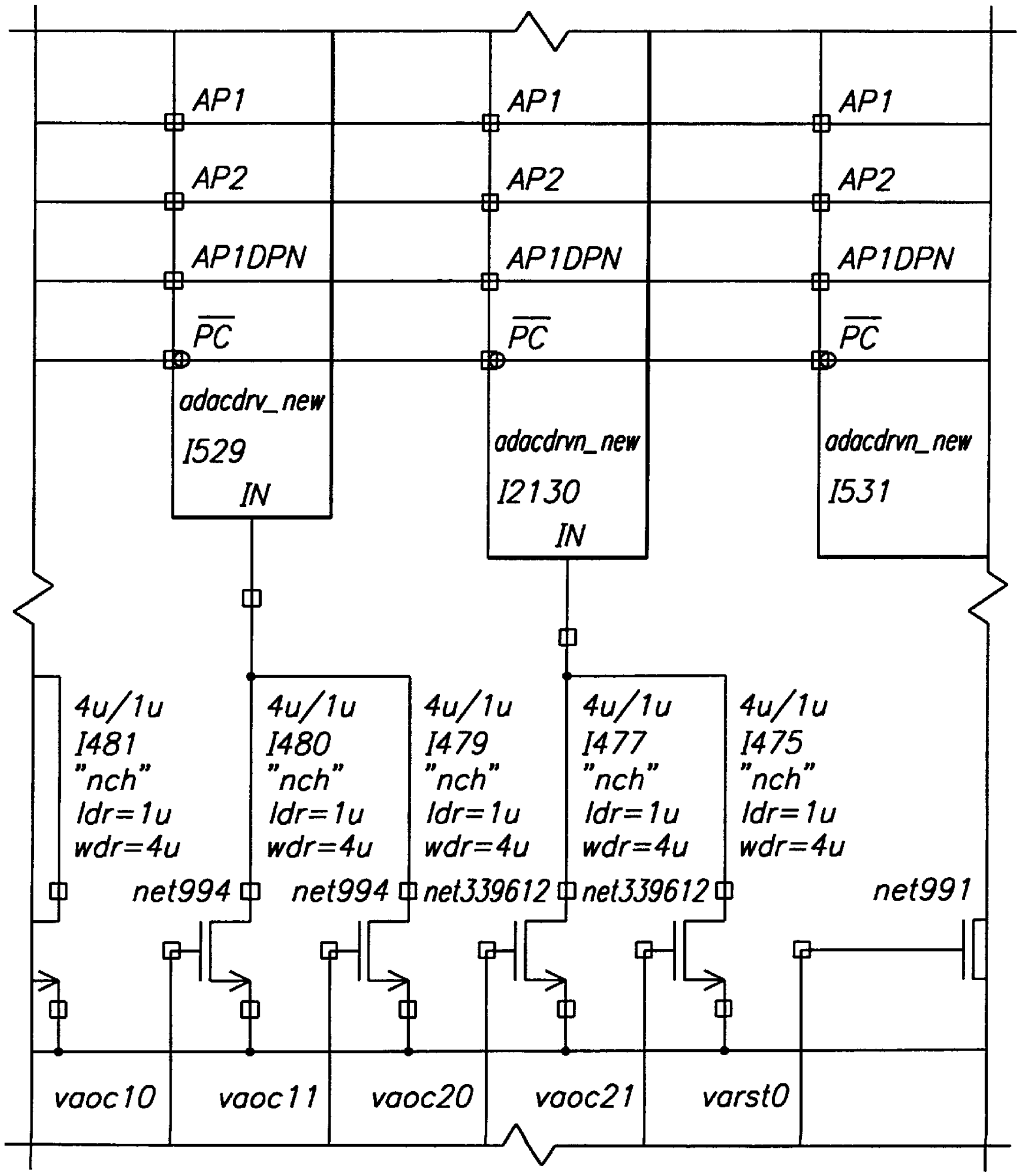
Fig 9.0103CF

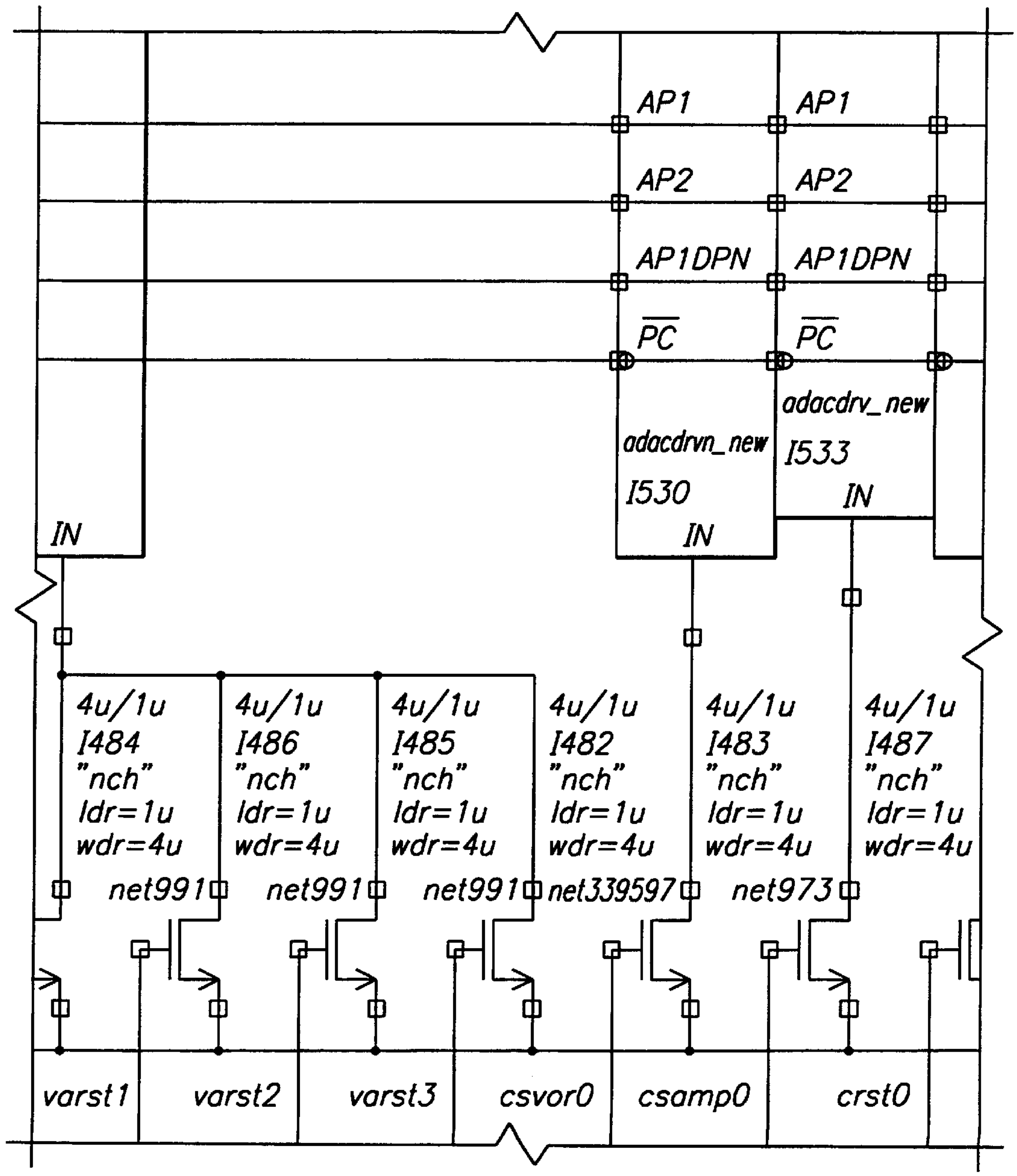
Fig 9.0103CG

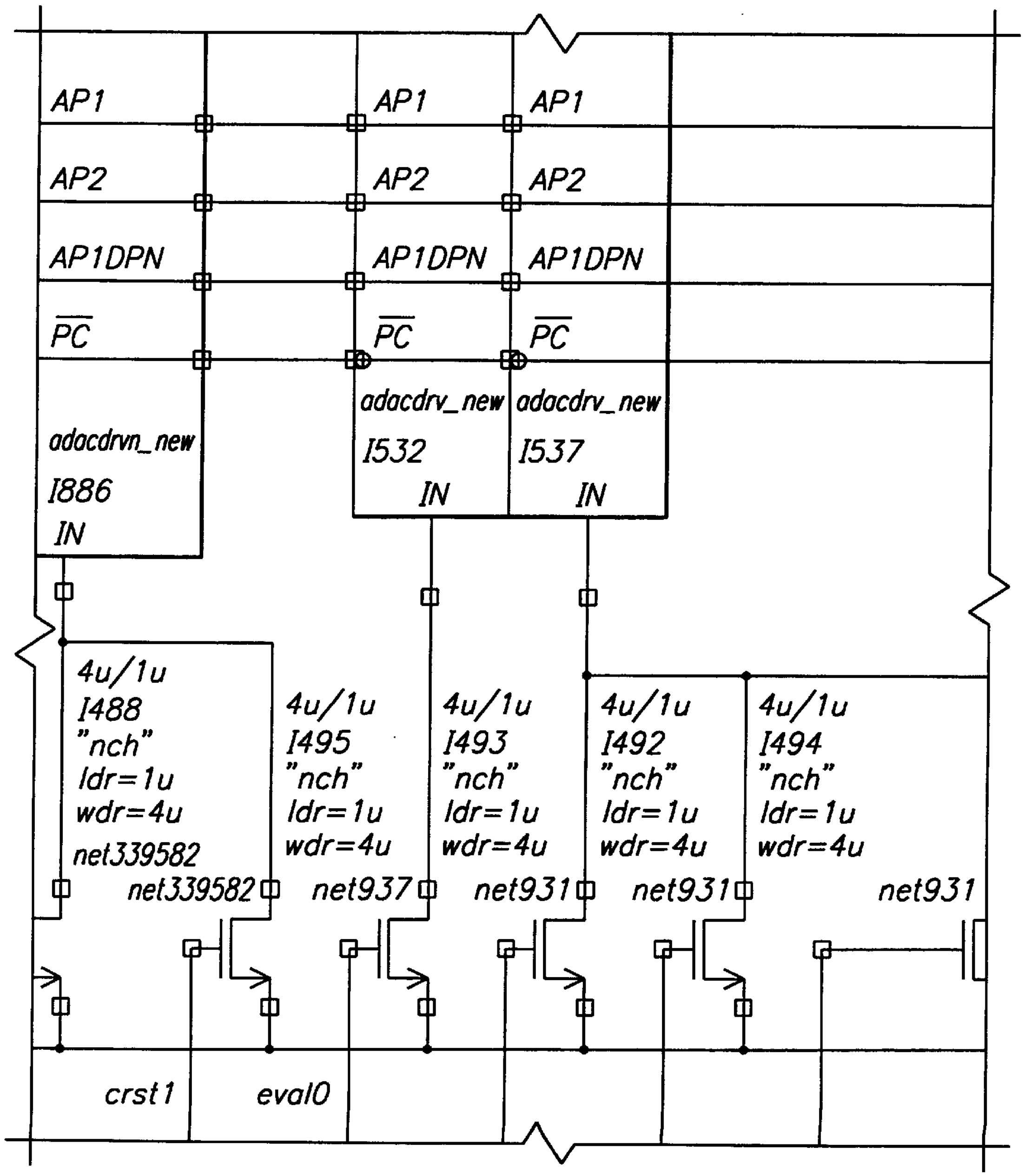
FIG 9.010.3CH

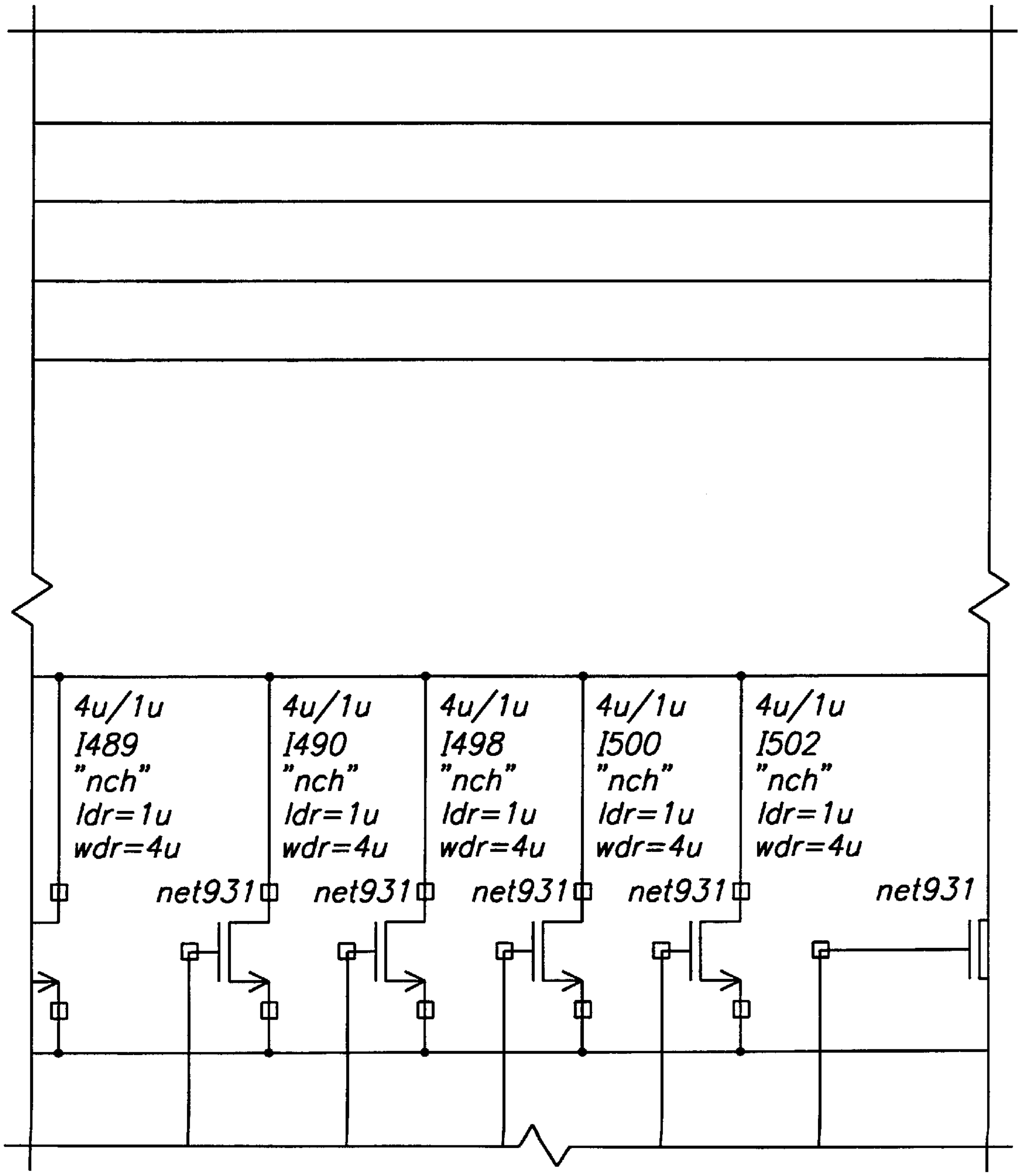
Fig 9.0103C I

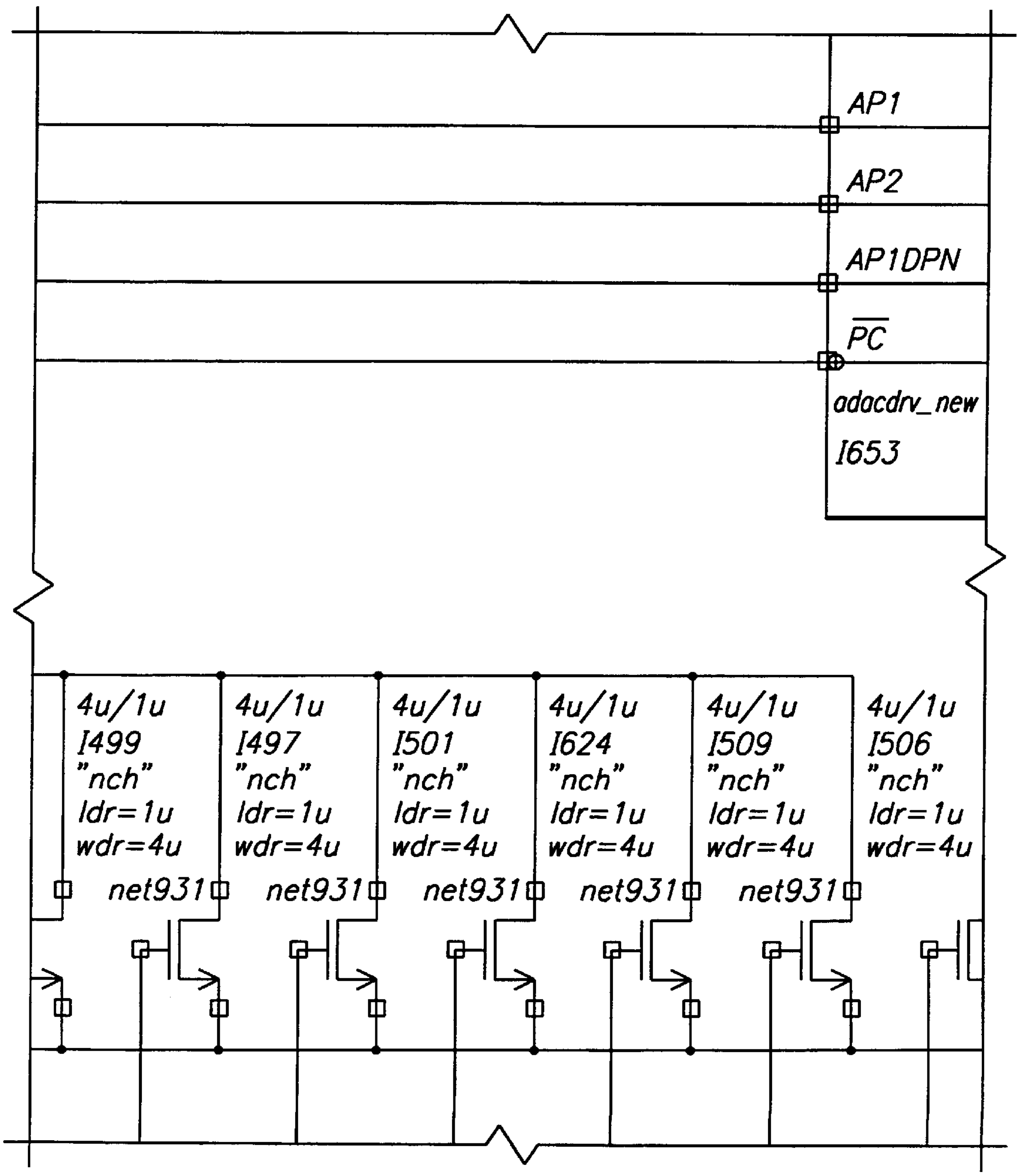
Fig 9.0103Cd

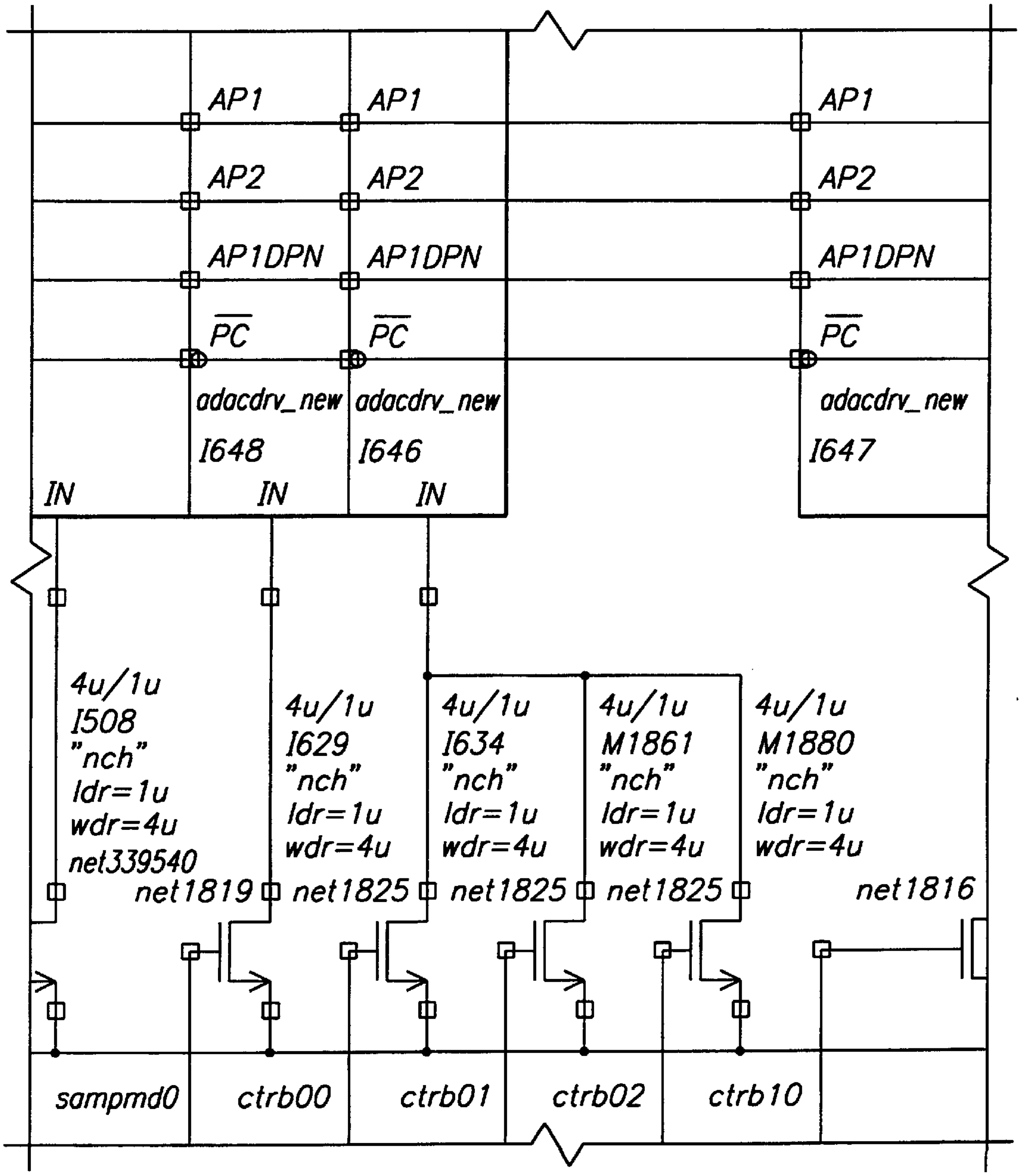
FIG 9.010 3CK

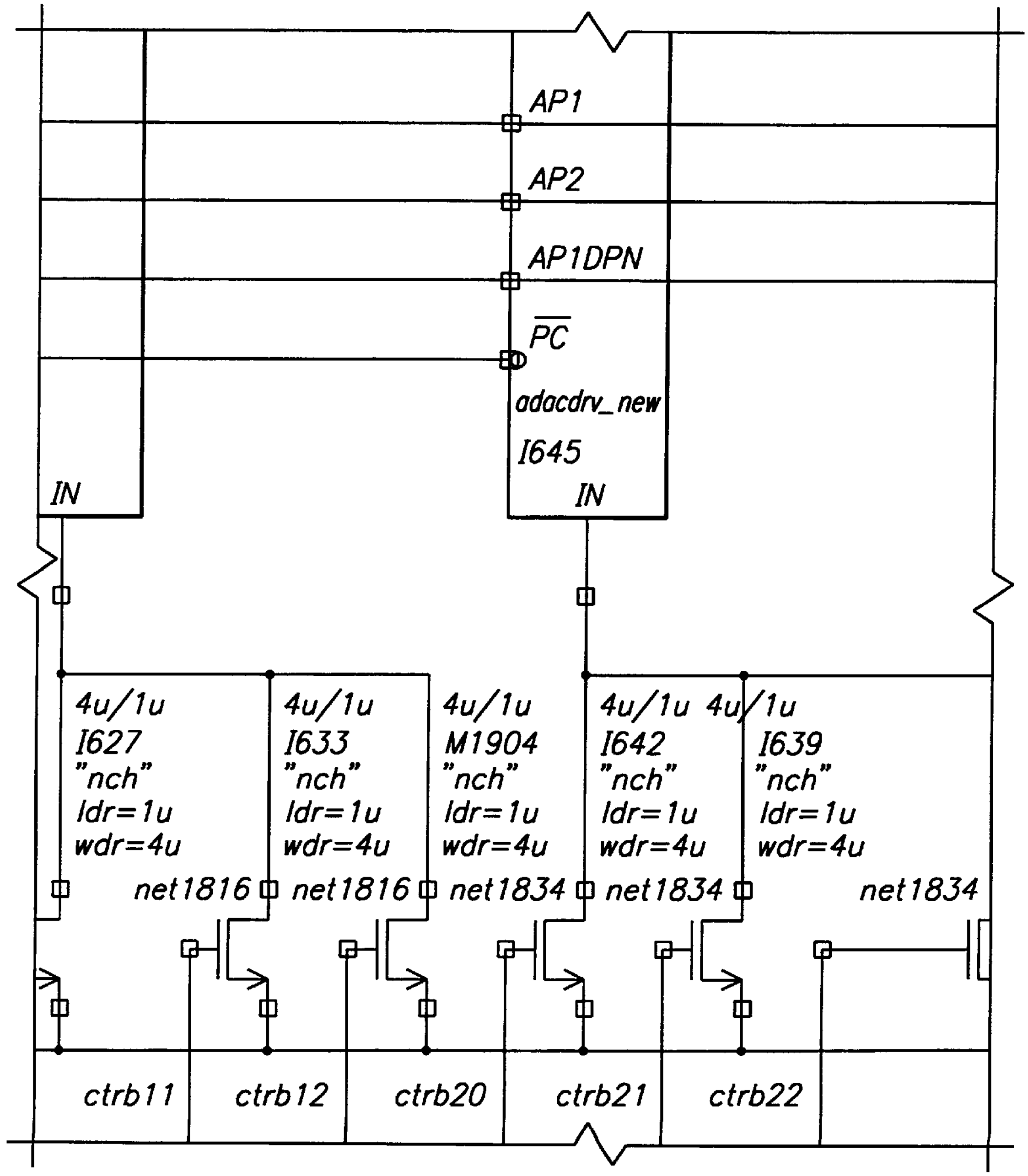
Fig. 9.0103CL

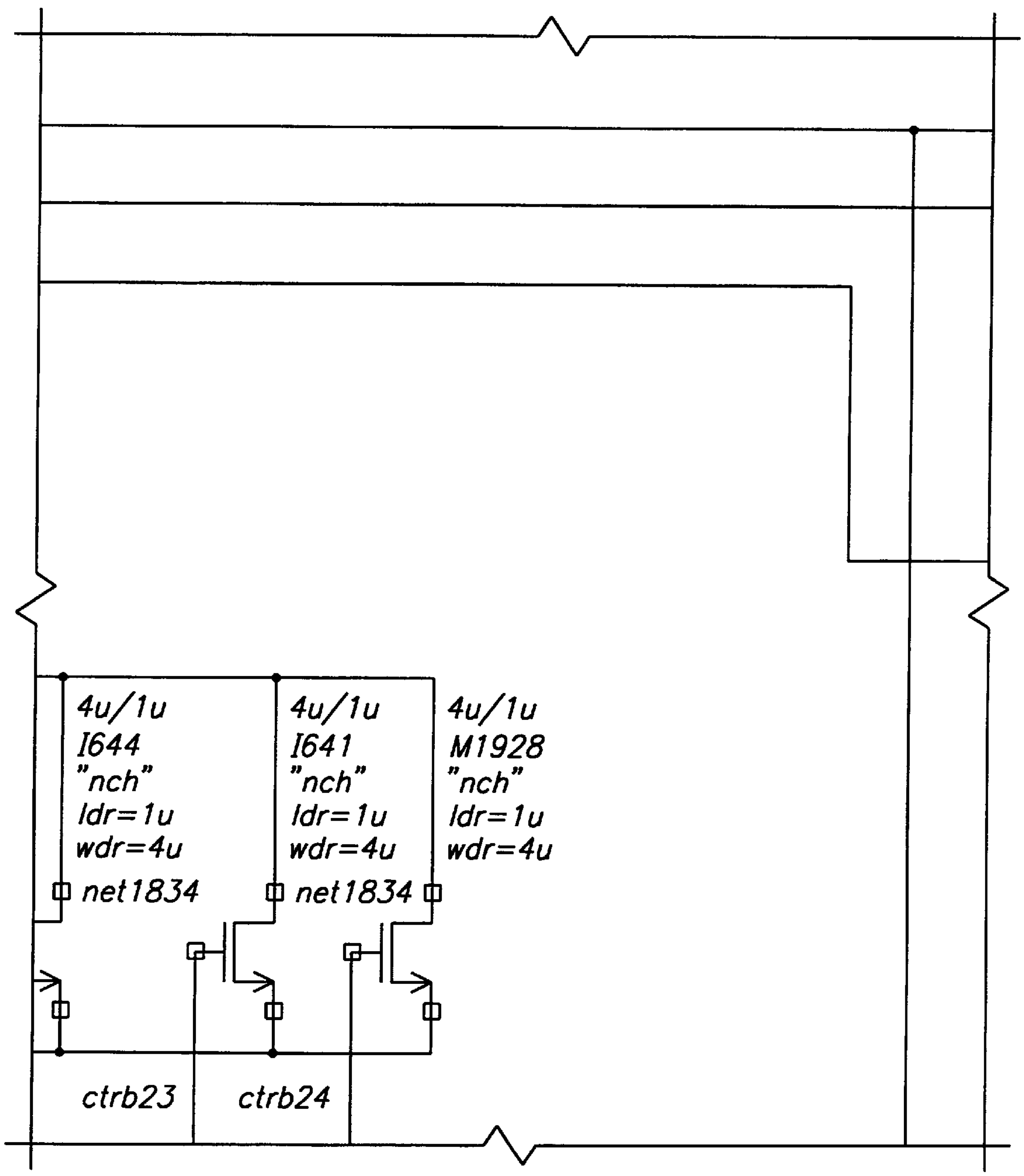
Fig 9.0103CM

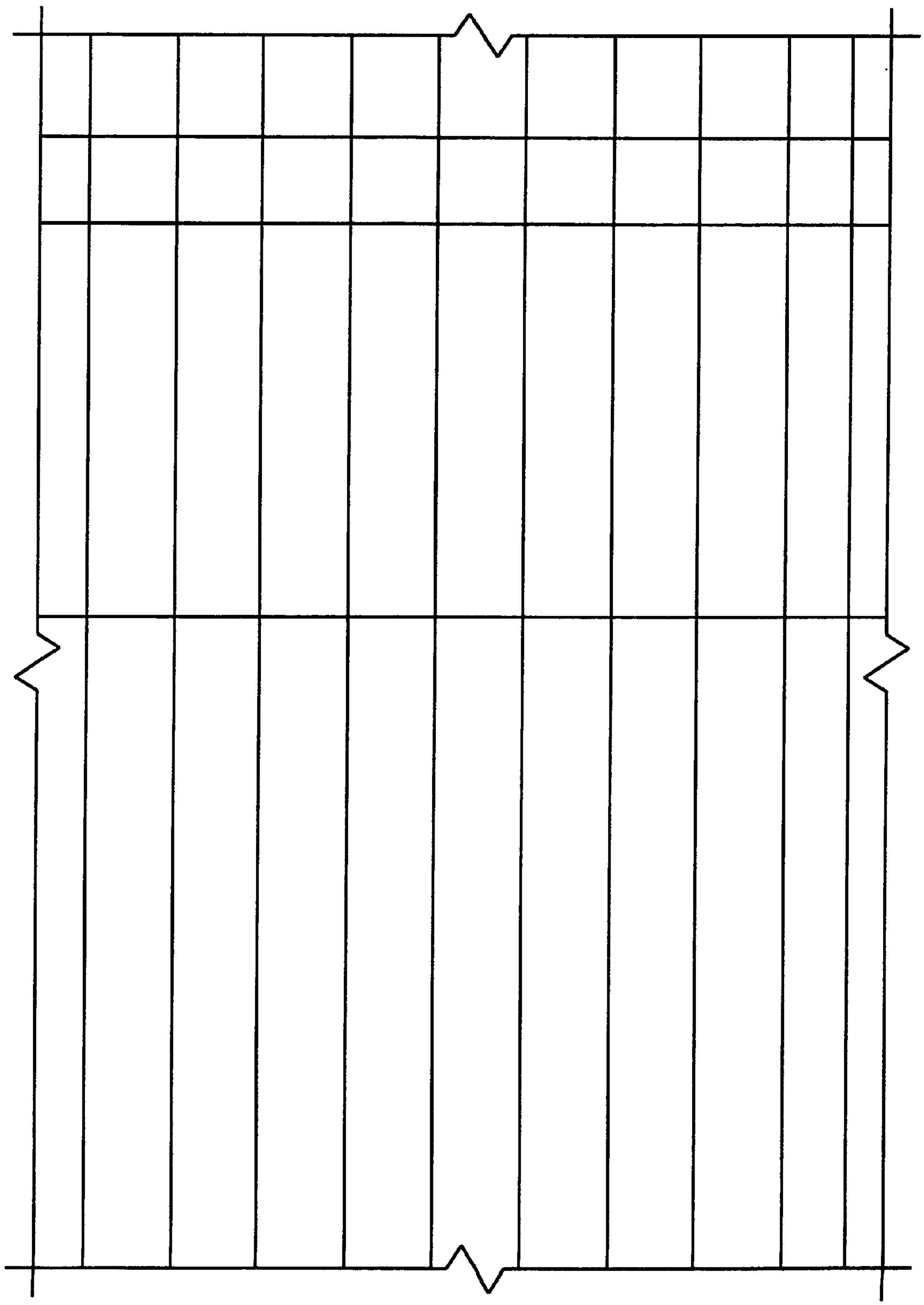
Fig. 9.0103CN

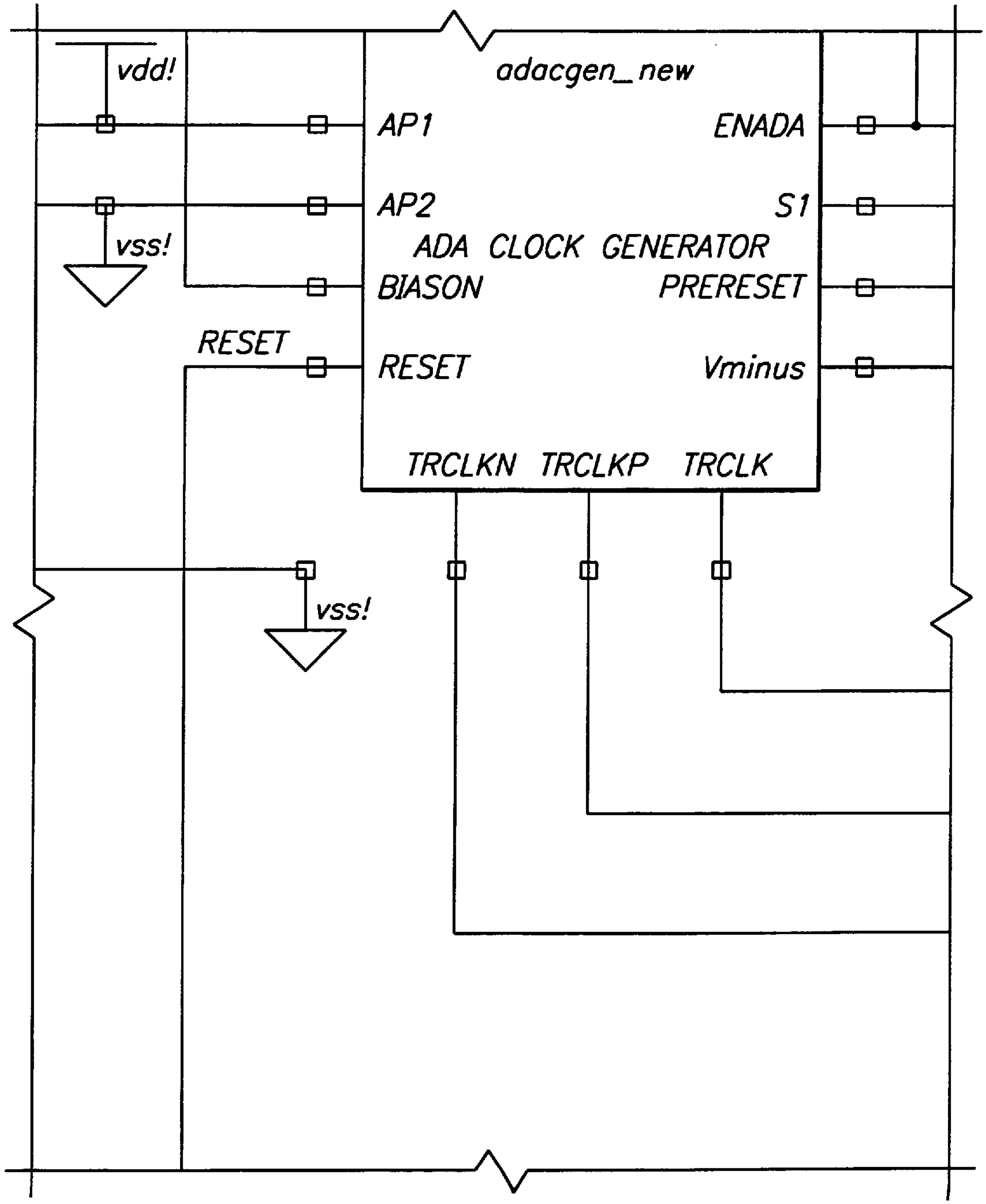
FIG. 9.0103C0

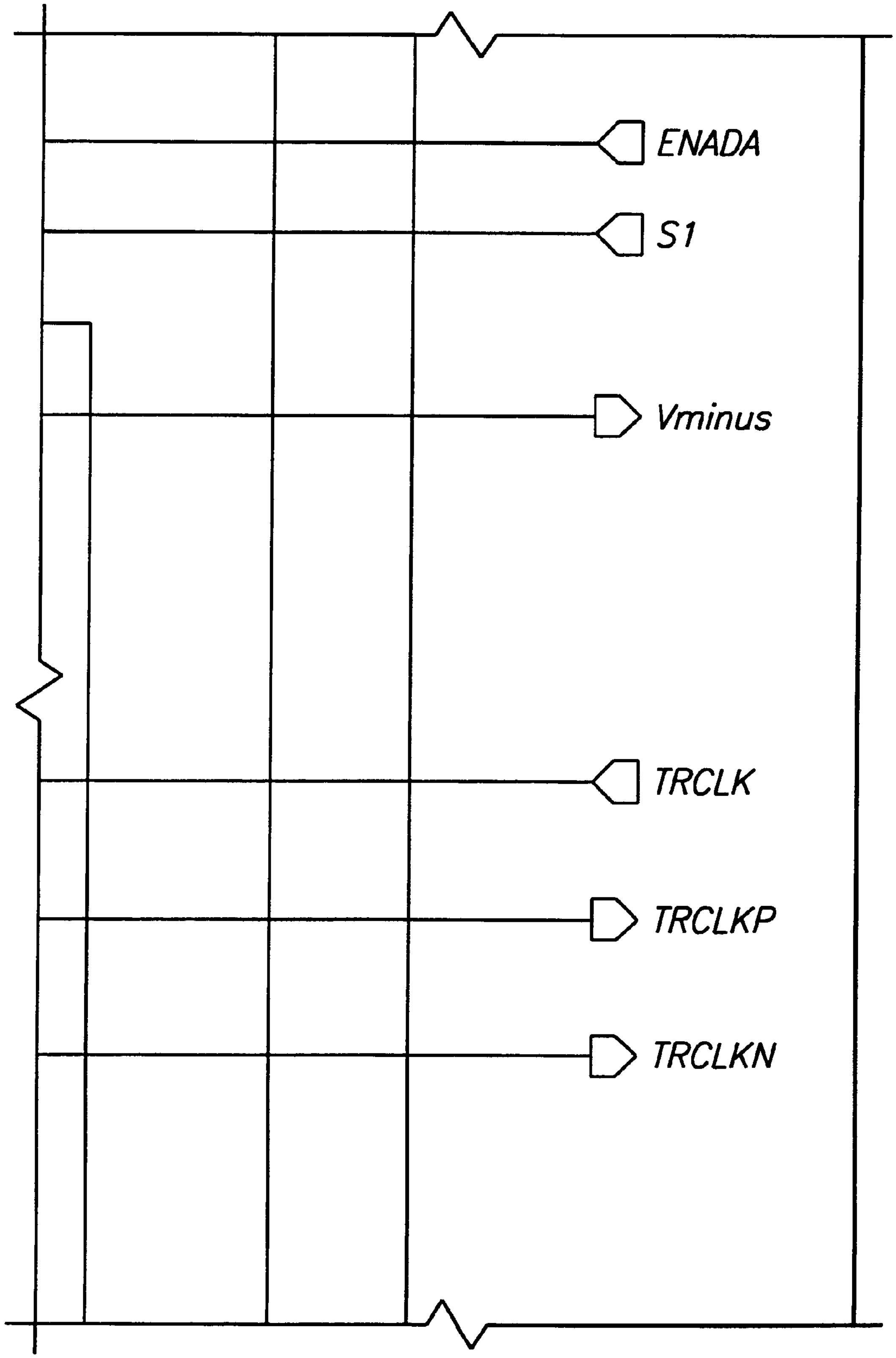
Fig 9.0103CP

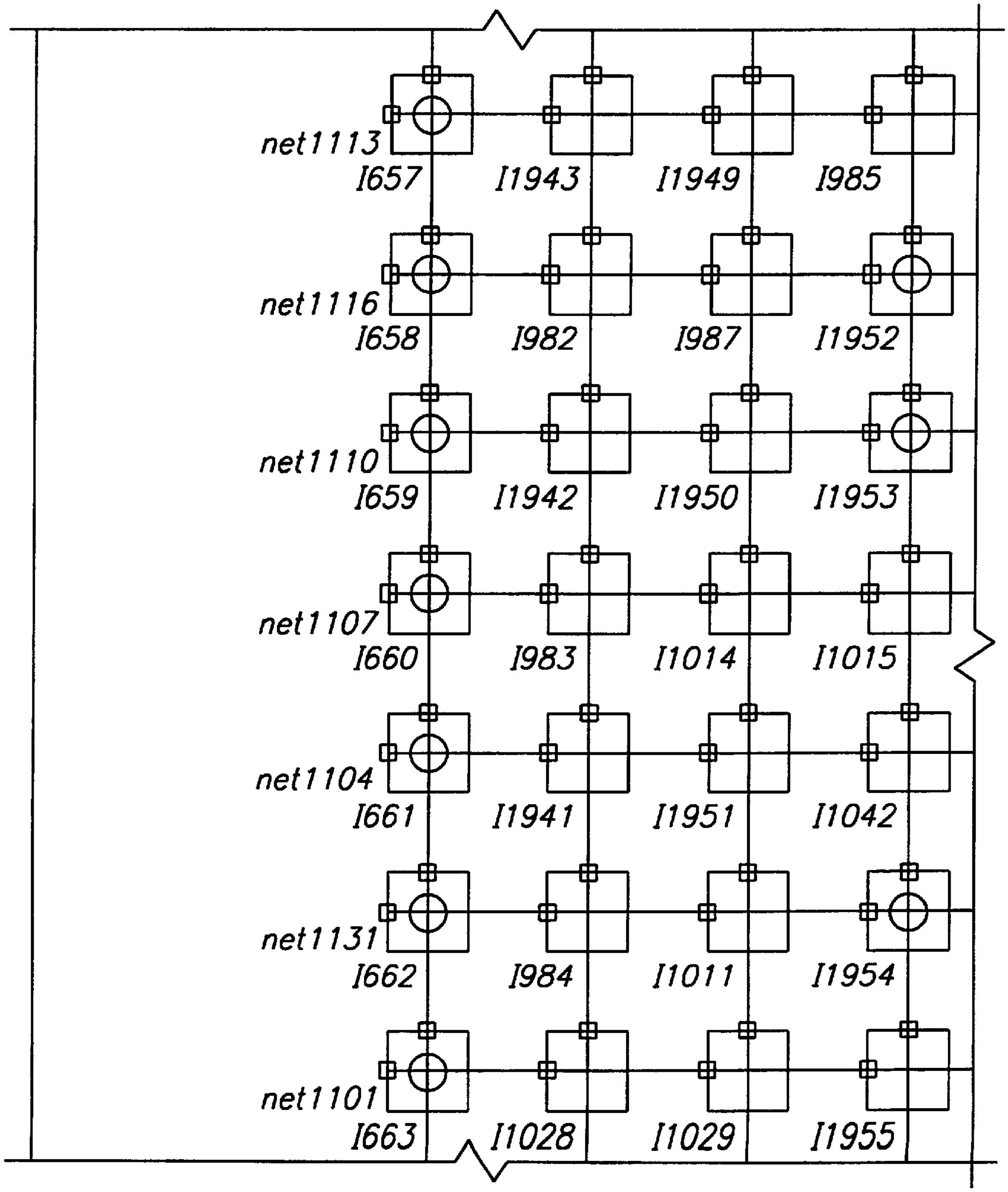
FIG 9.0103DA

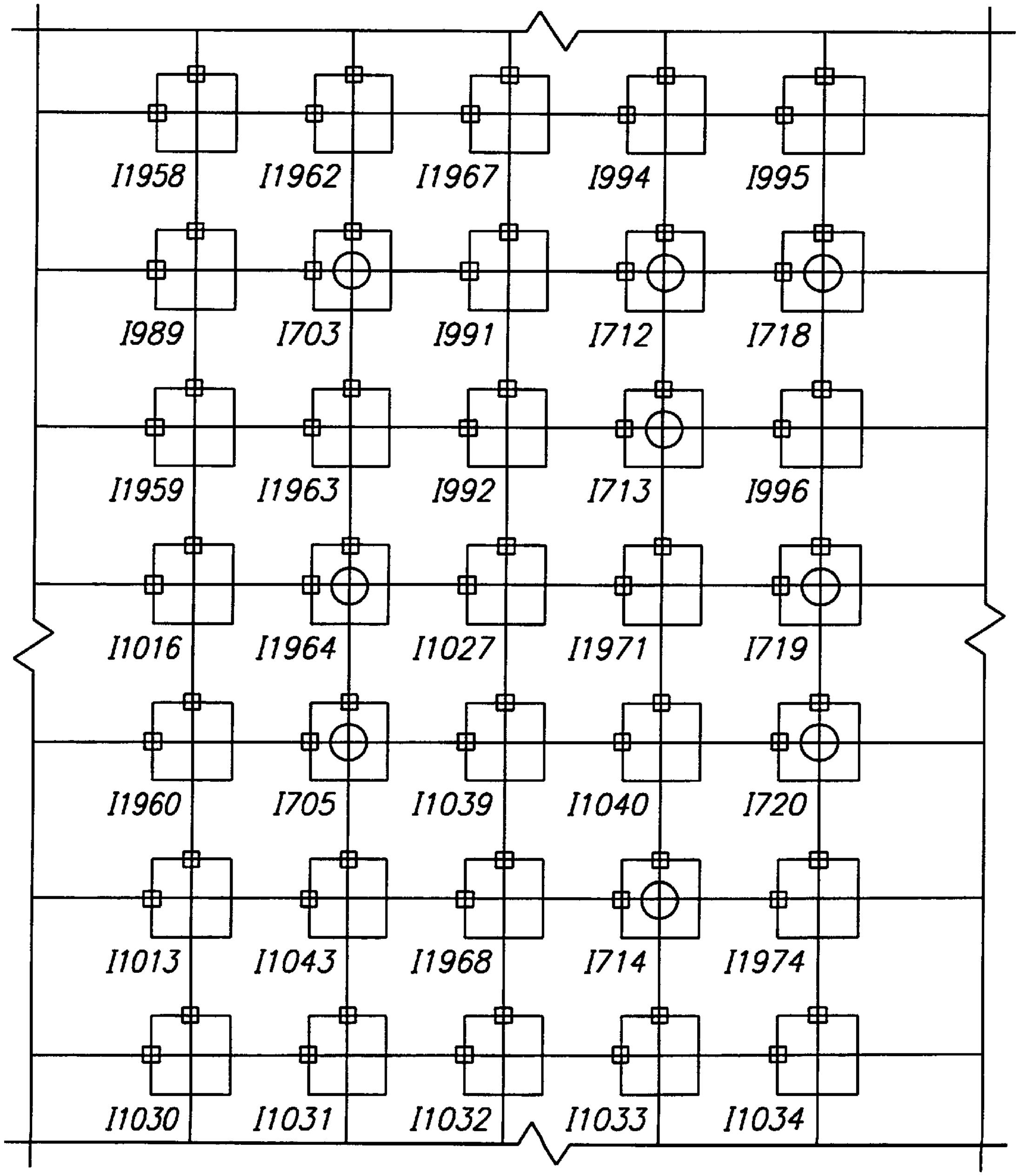
FIG. 9.01030DB

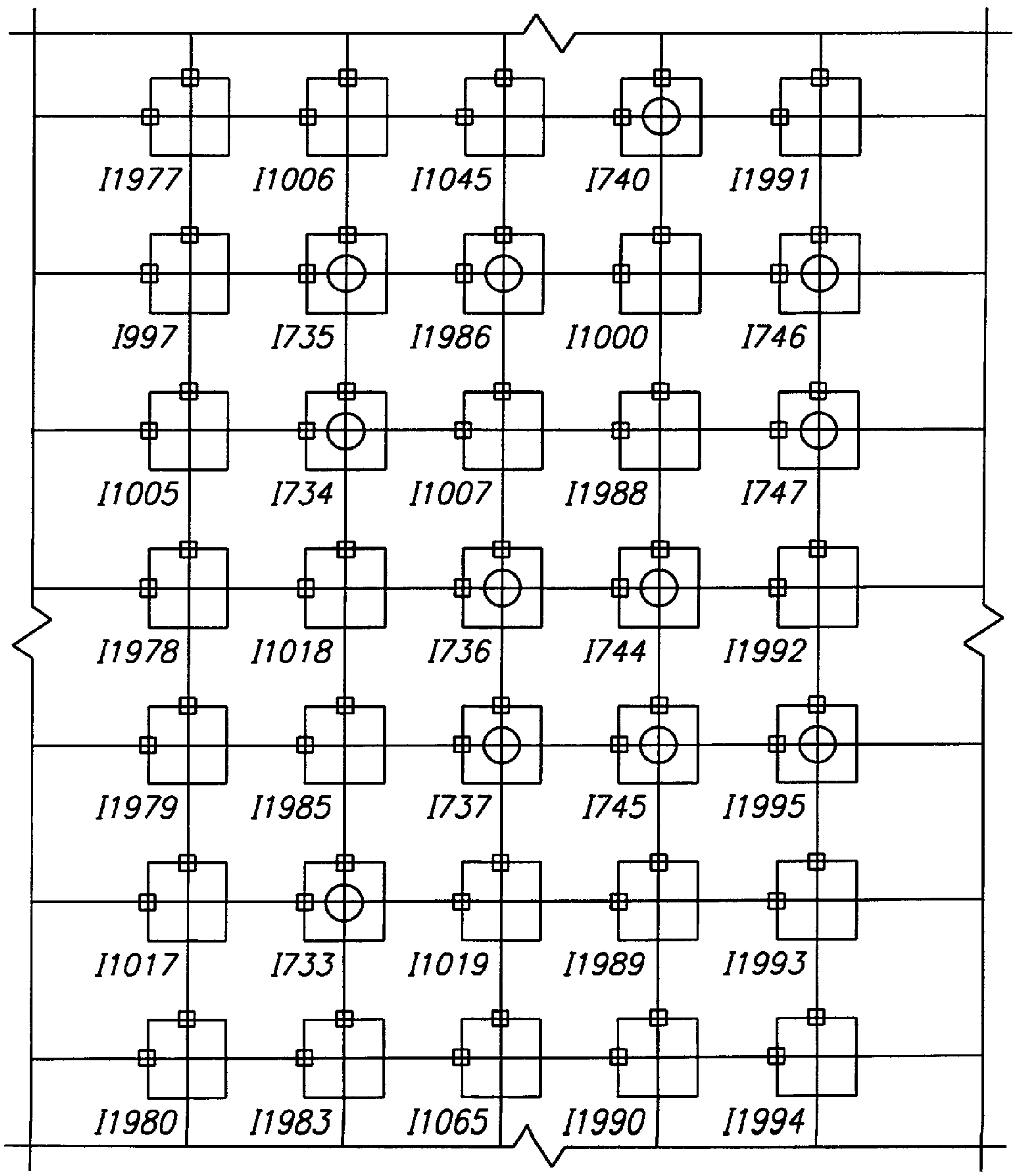
Fig 9.01103DC

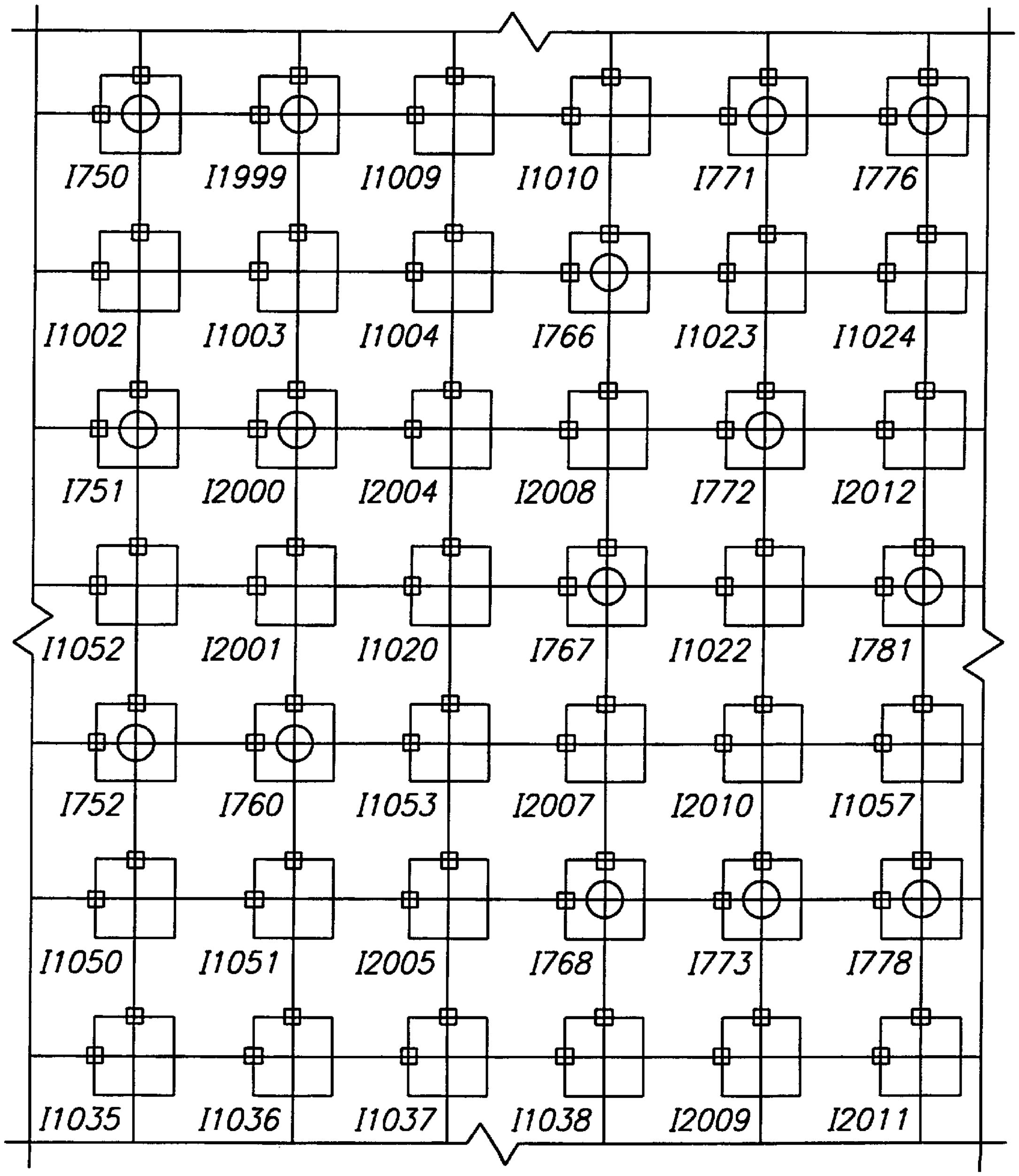
Fig 9.0103DD

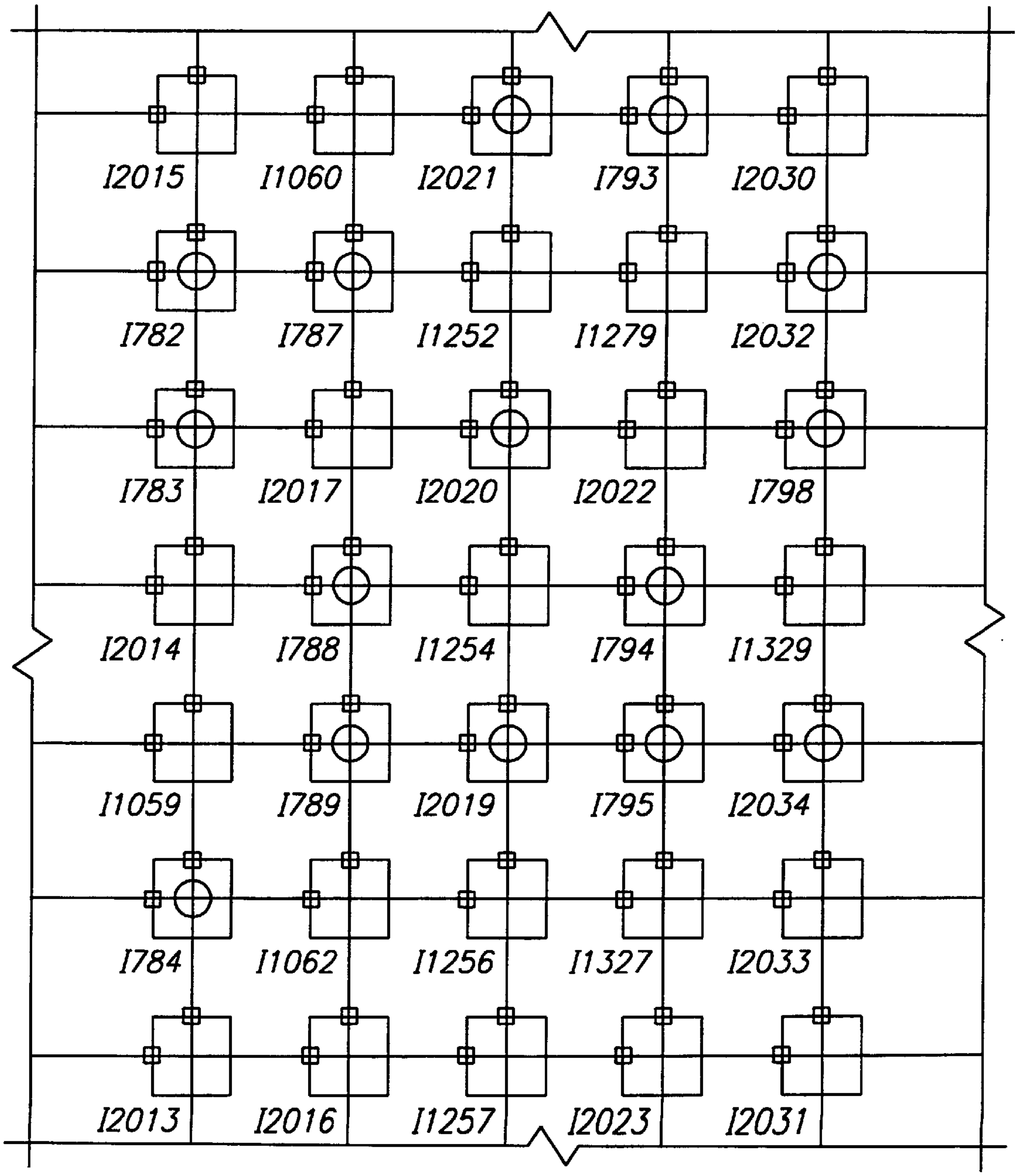
Fig 9.01.03DE

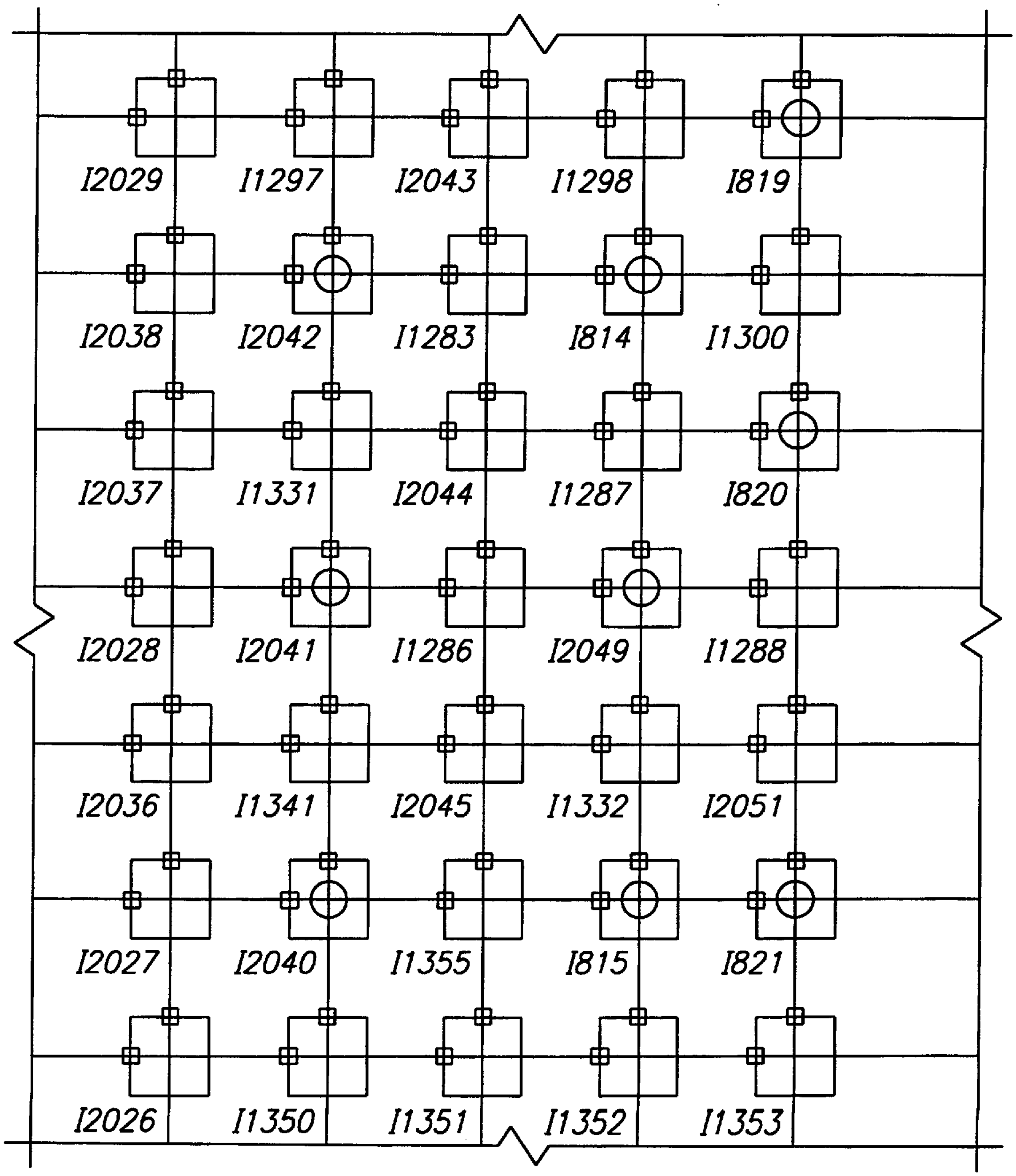
FIG 9.01O3DF

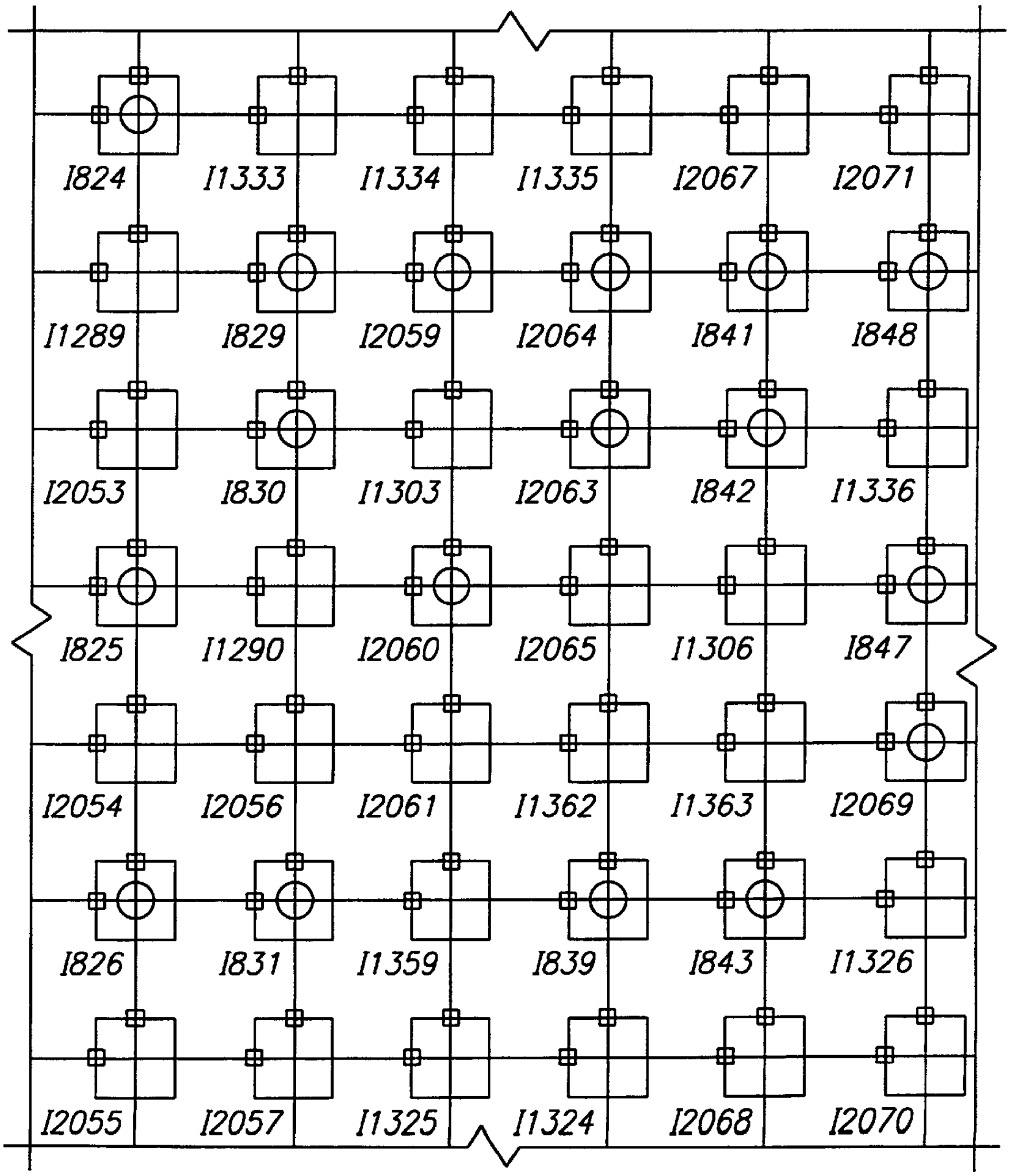
FIG 9.0103DG

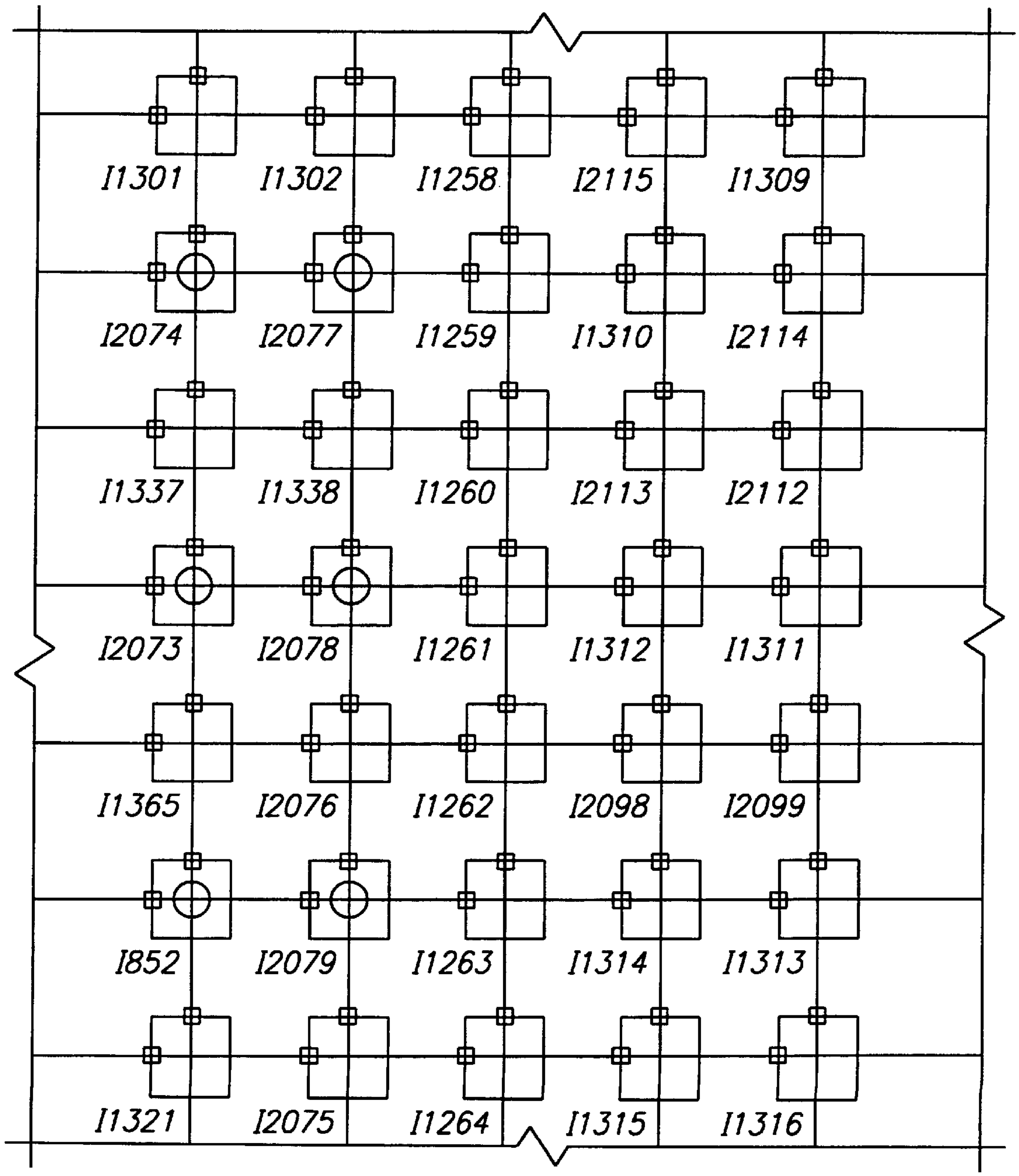
Fig 9.0103DH

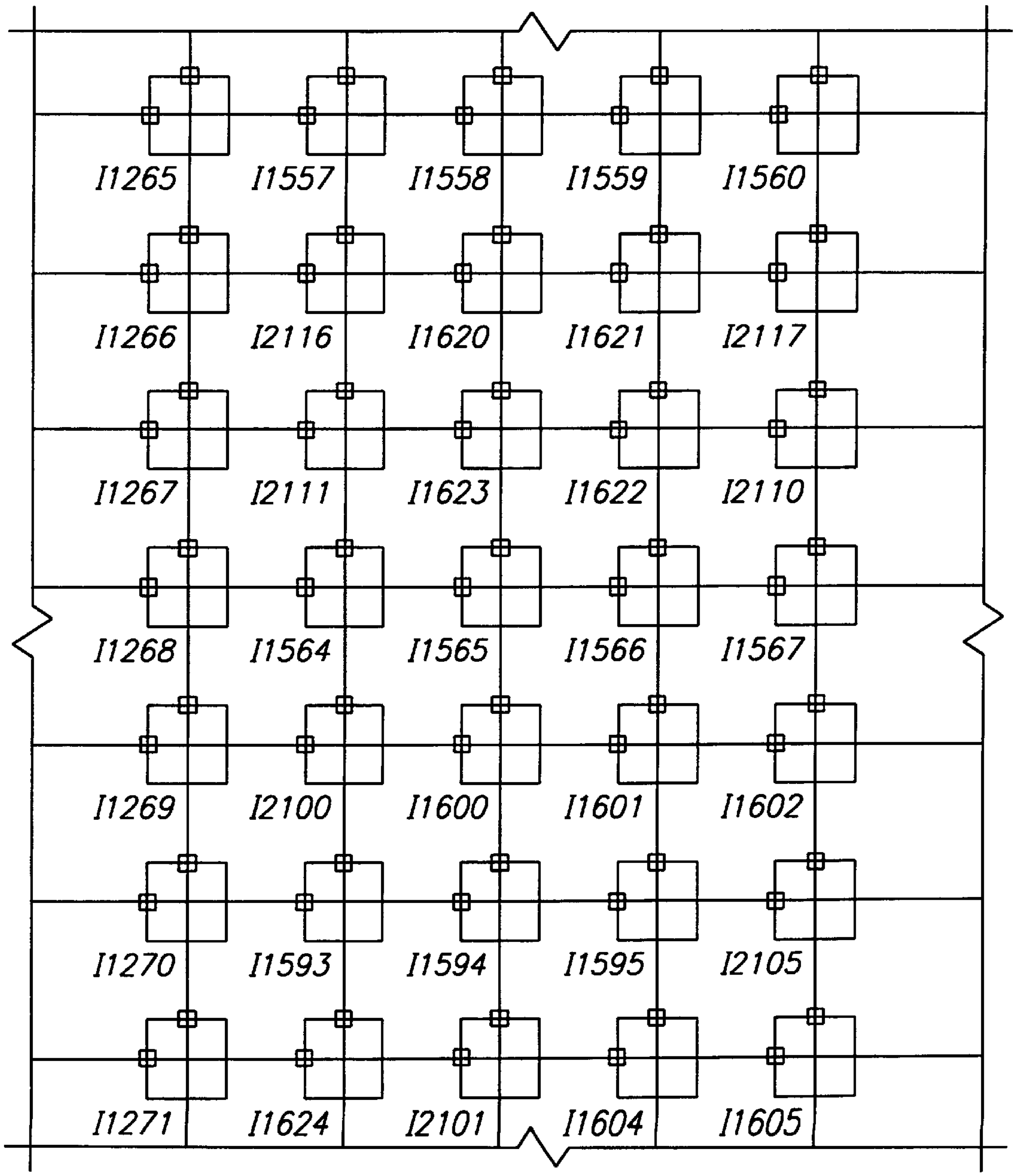
FIG. 9.010301

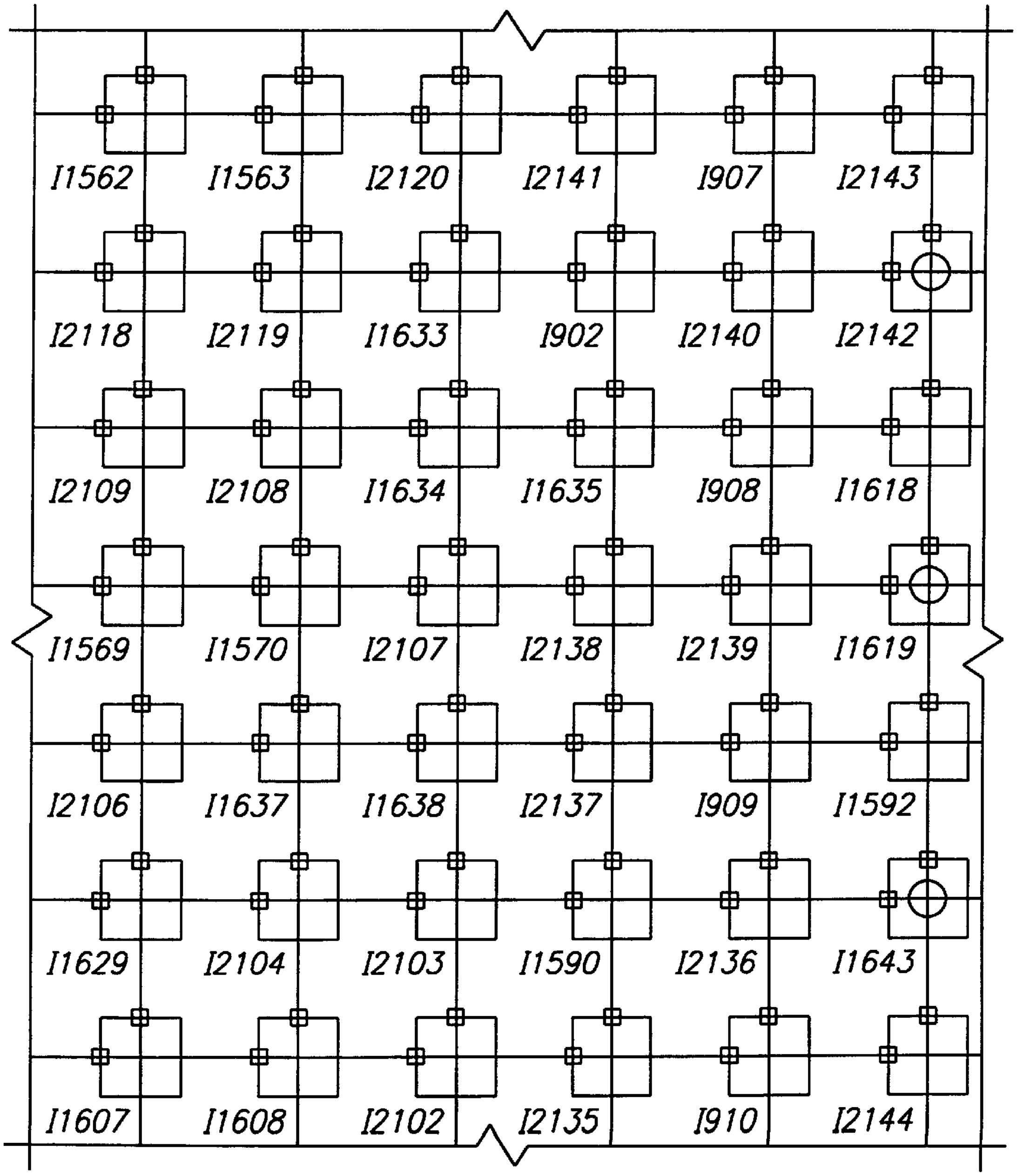
Fig 9.0103D.1

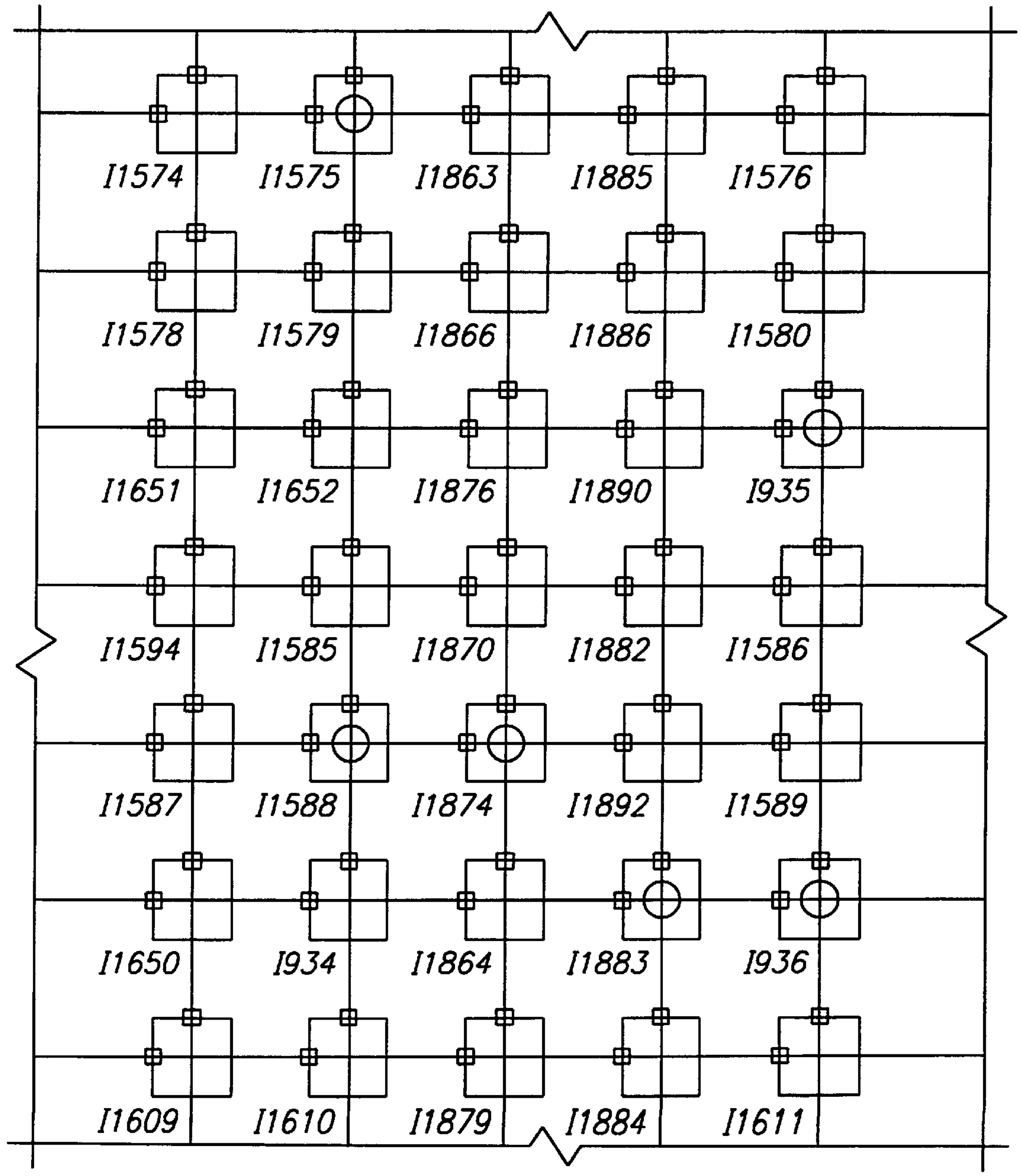
FIG 9.01.03DK

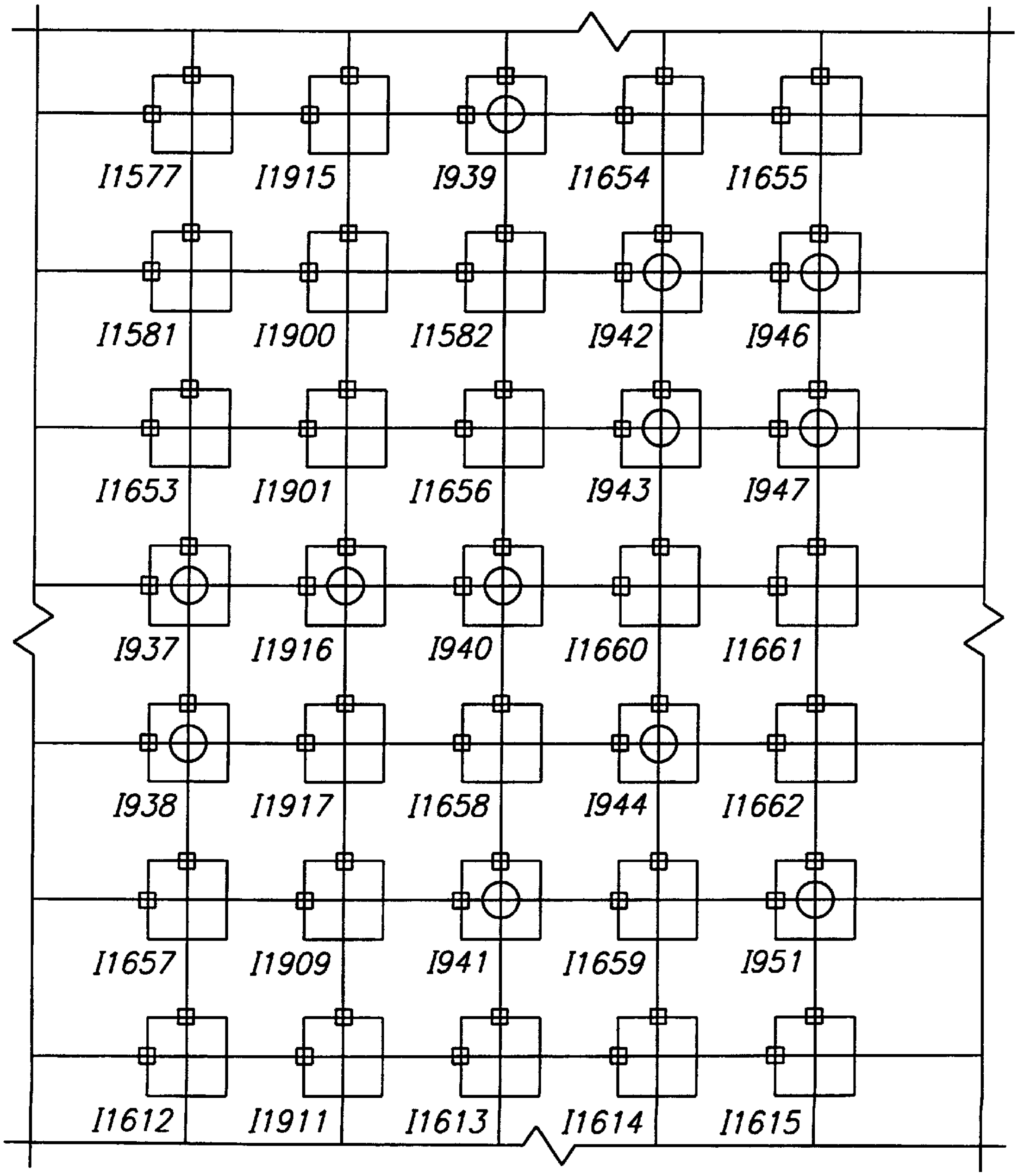
Fig 9.010301L

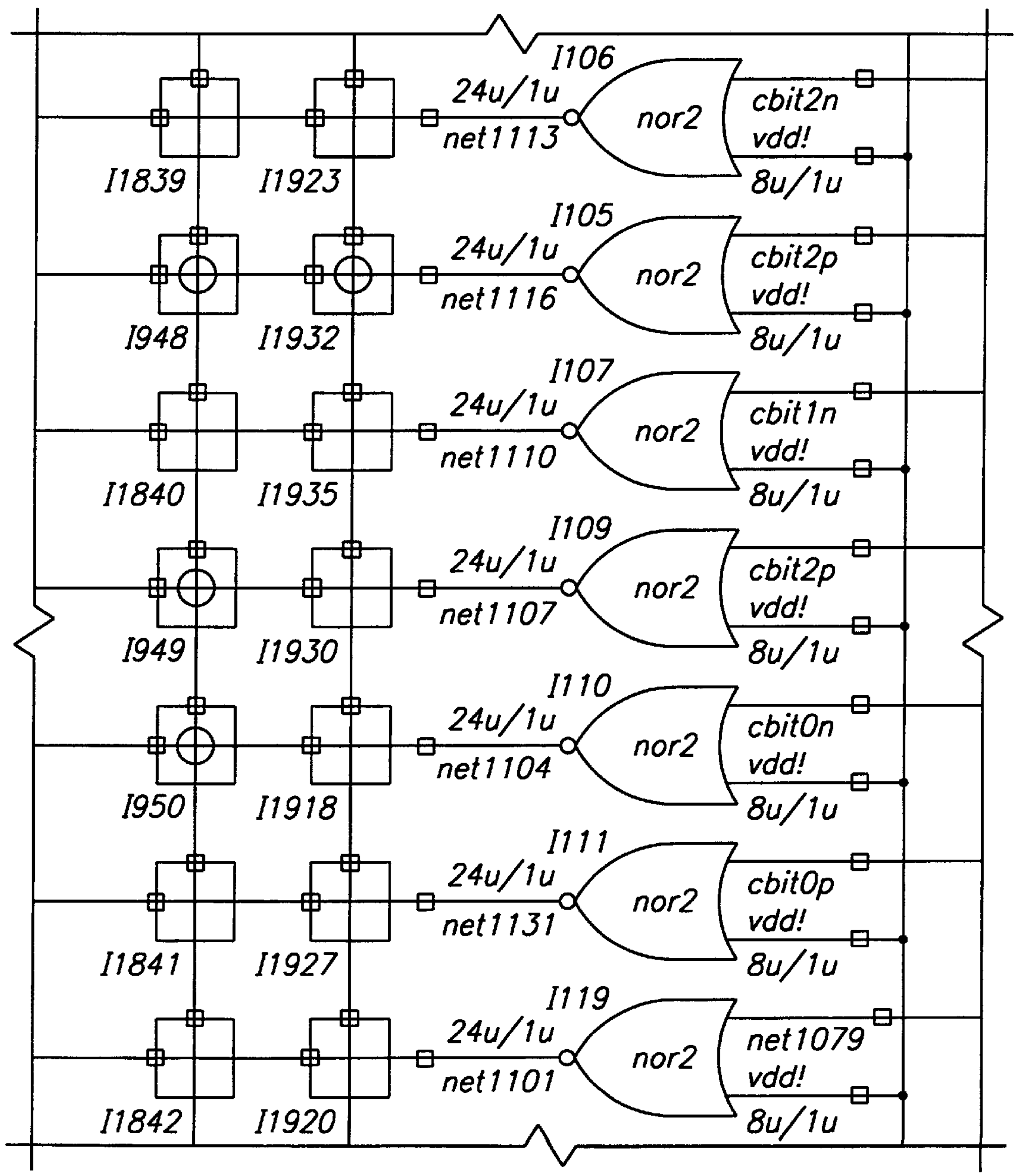
Fig 9.0103DM

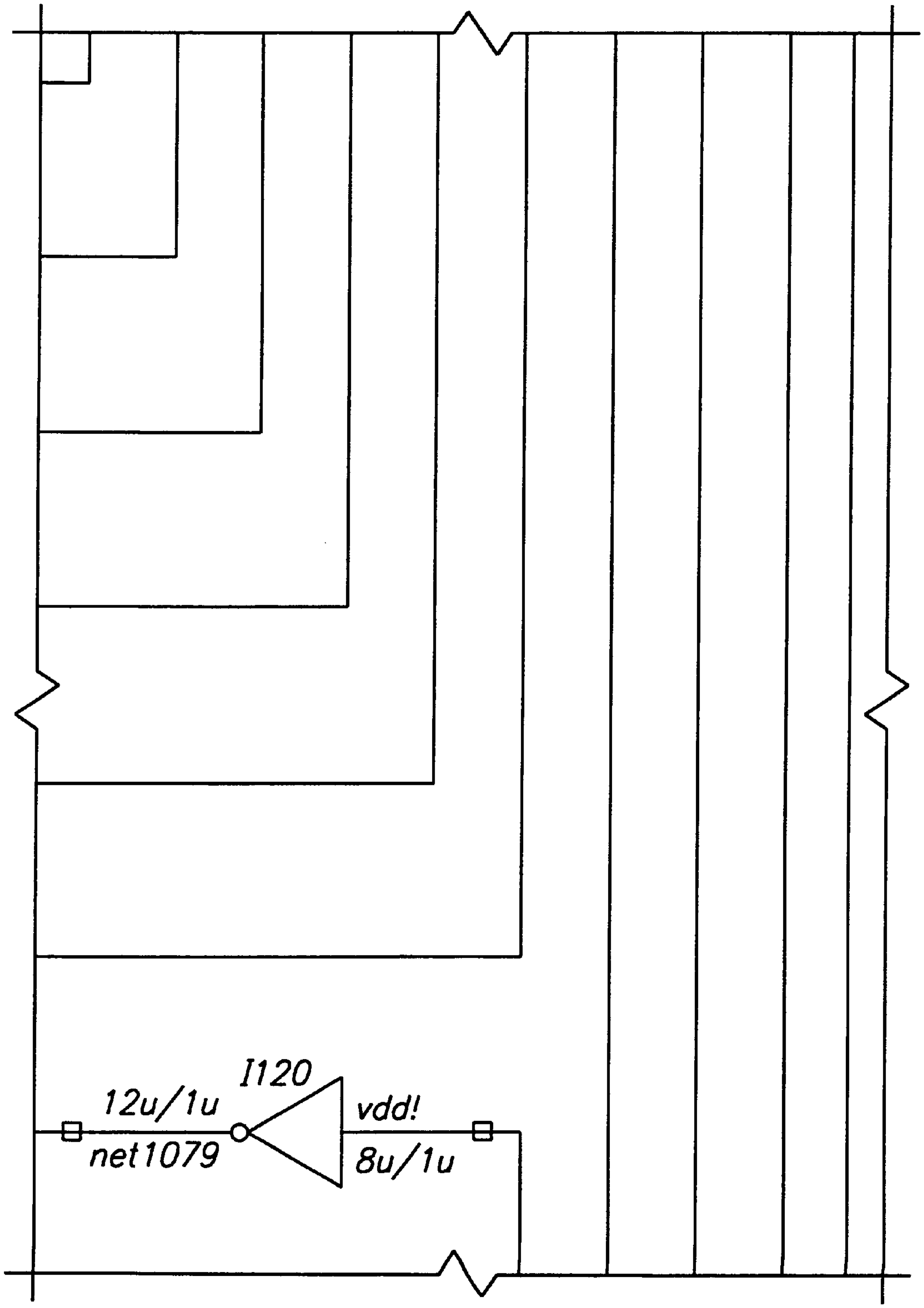
Fig 9.01103DN

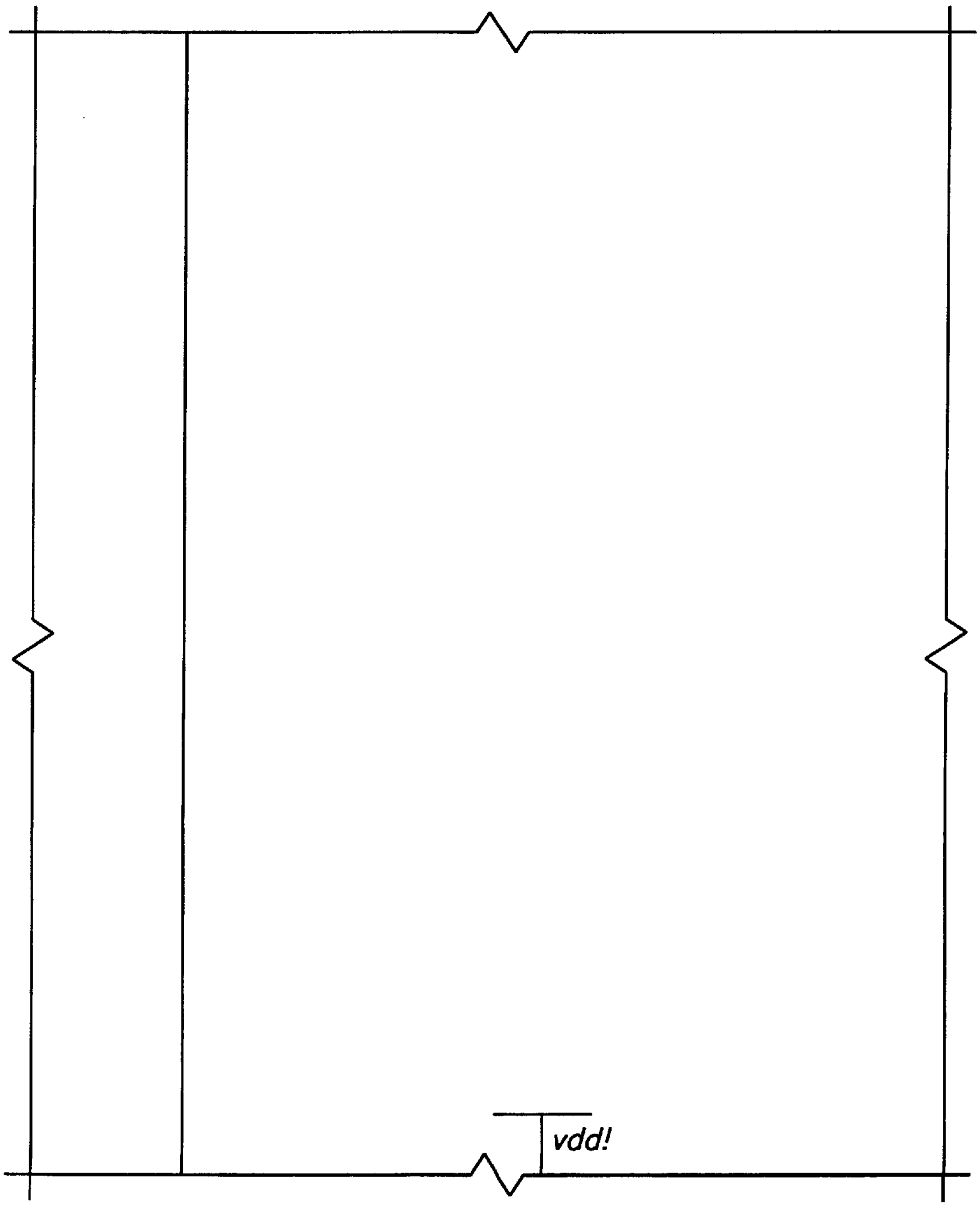
Fig 9.0103D0

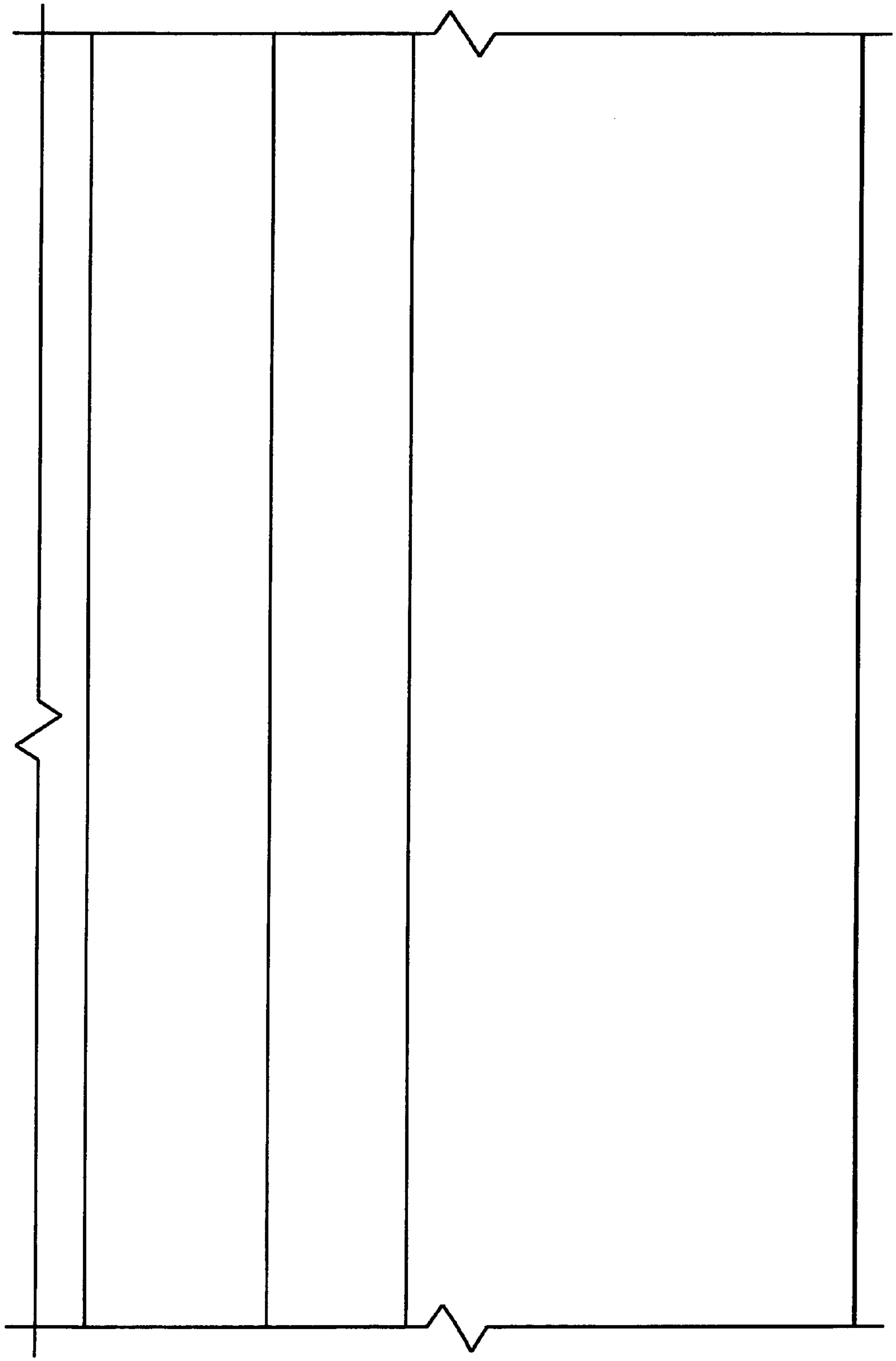
Fig 9.01103DP

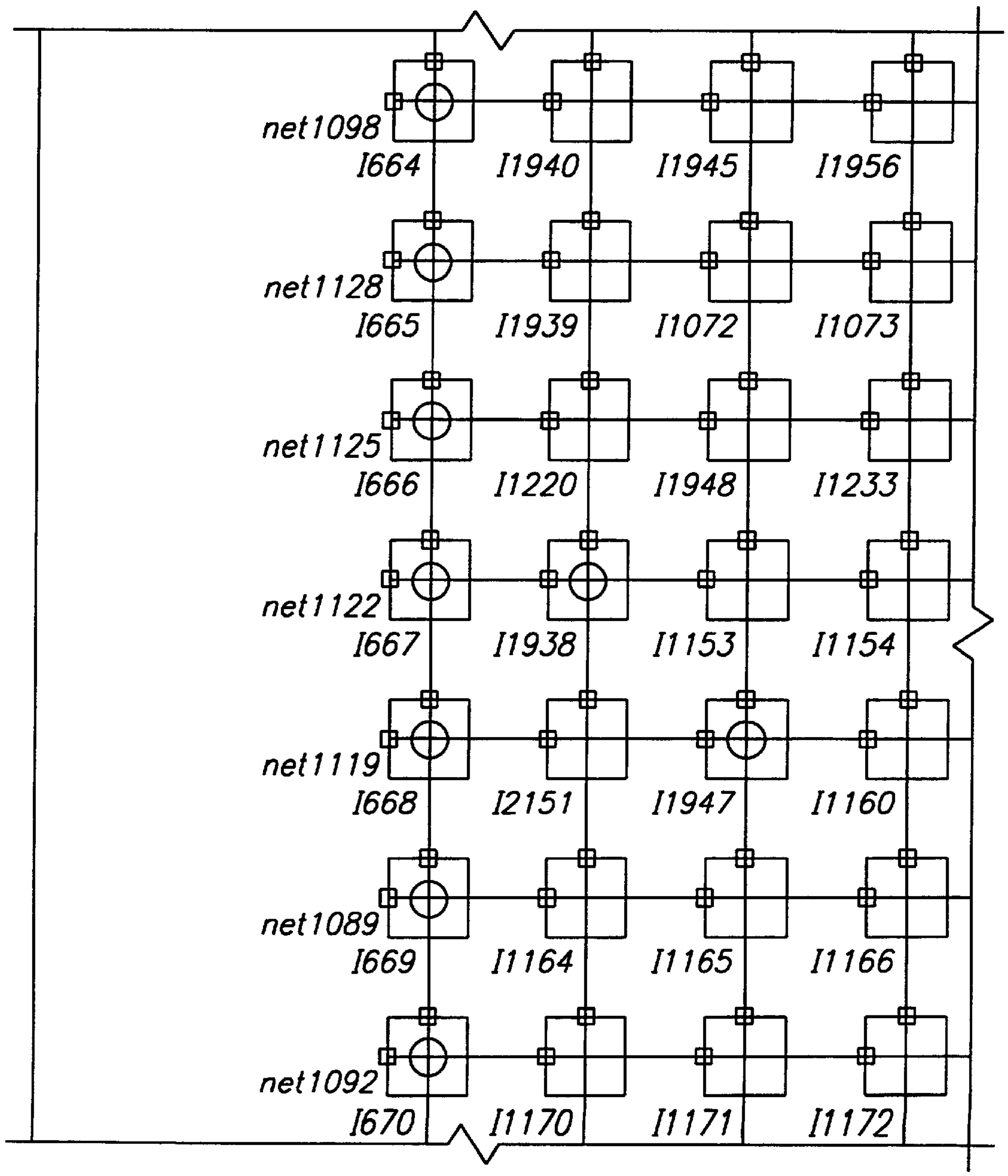
Fig. 9.0103EA

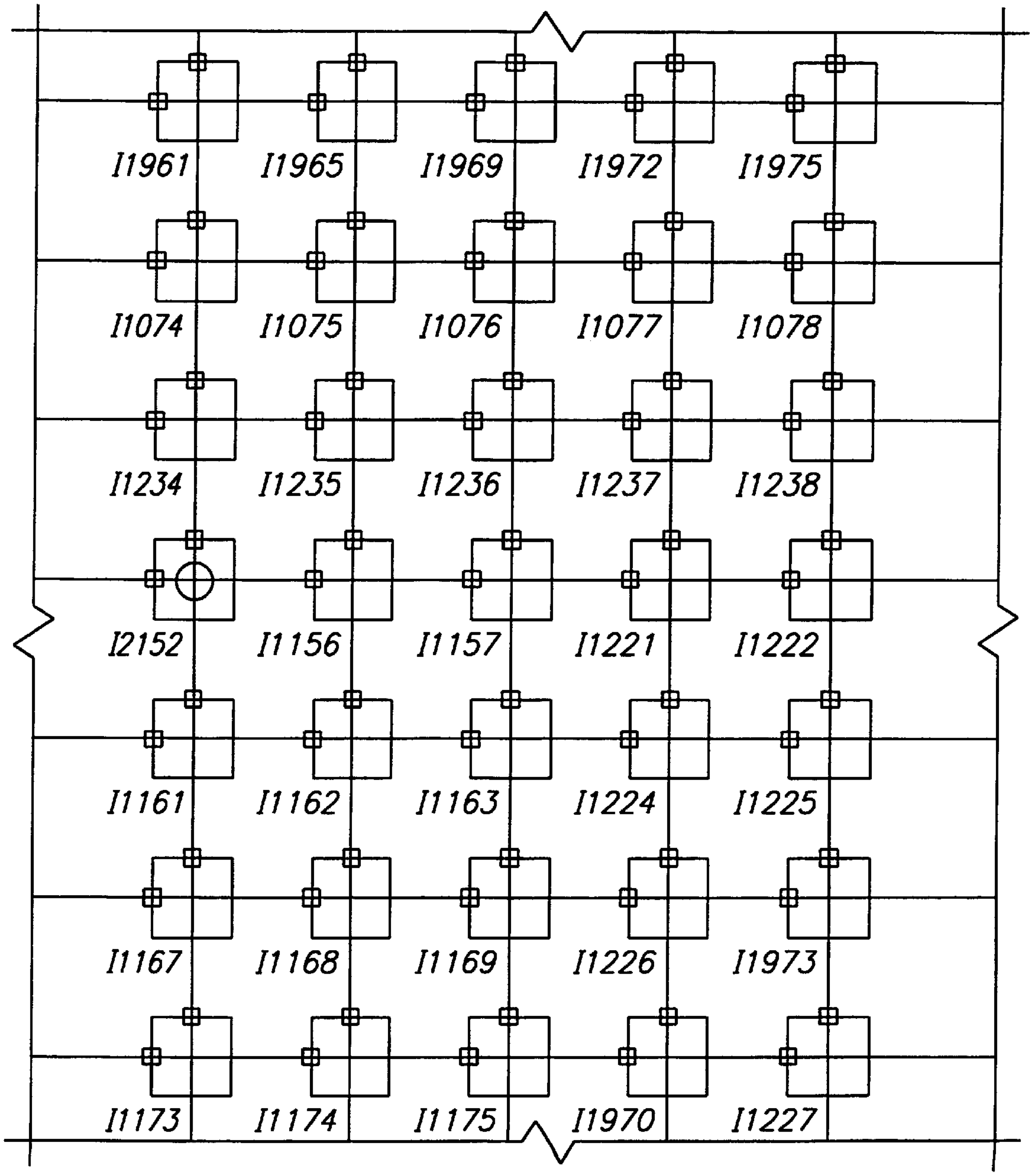
Fig 9.01.03EB

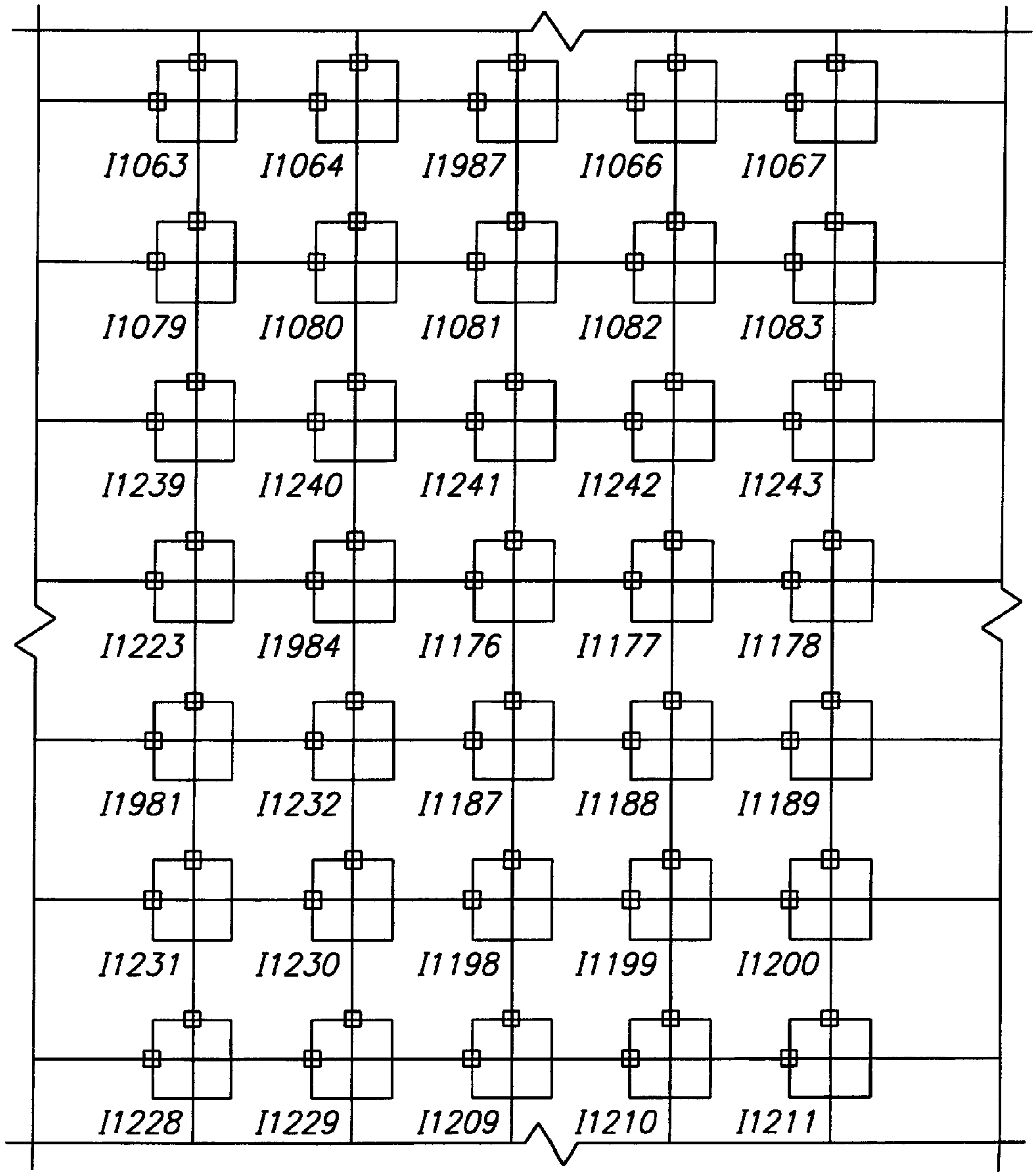
Fig. 9.0103EC

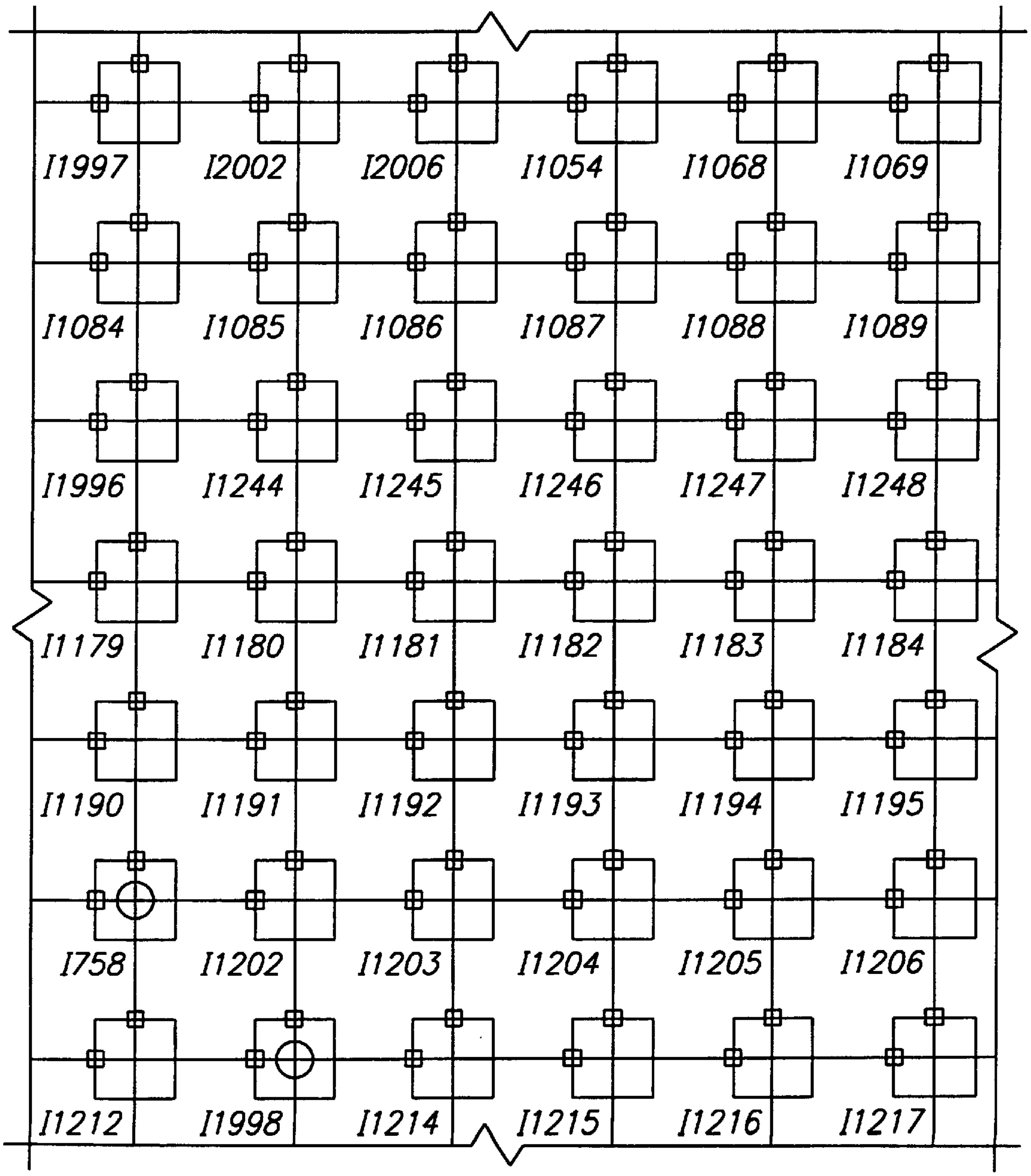
Fig 9.01O3ED

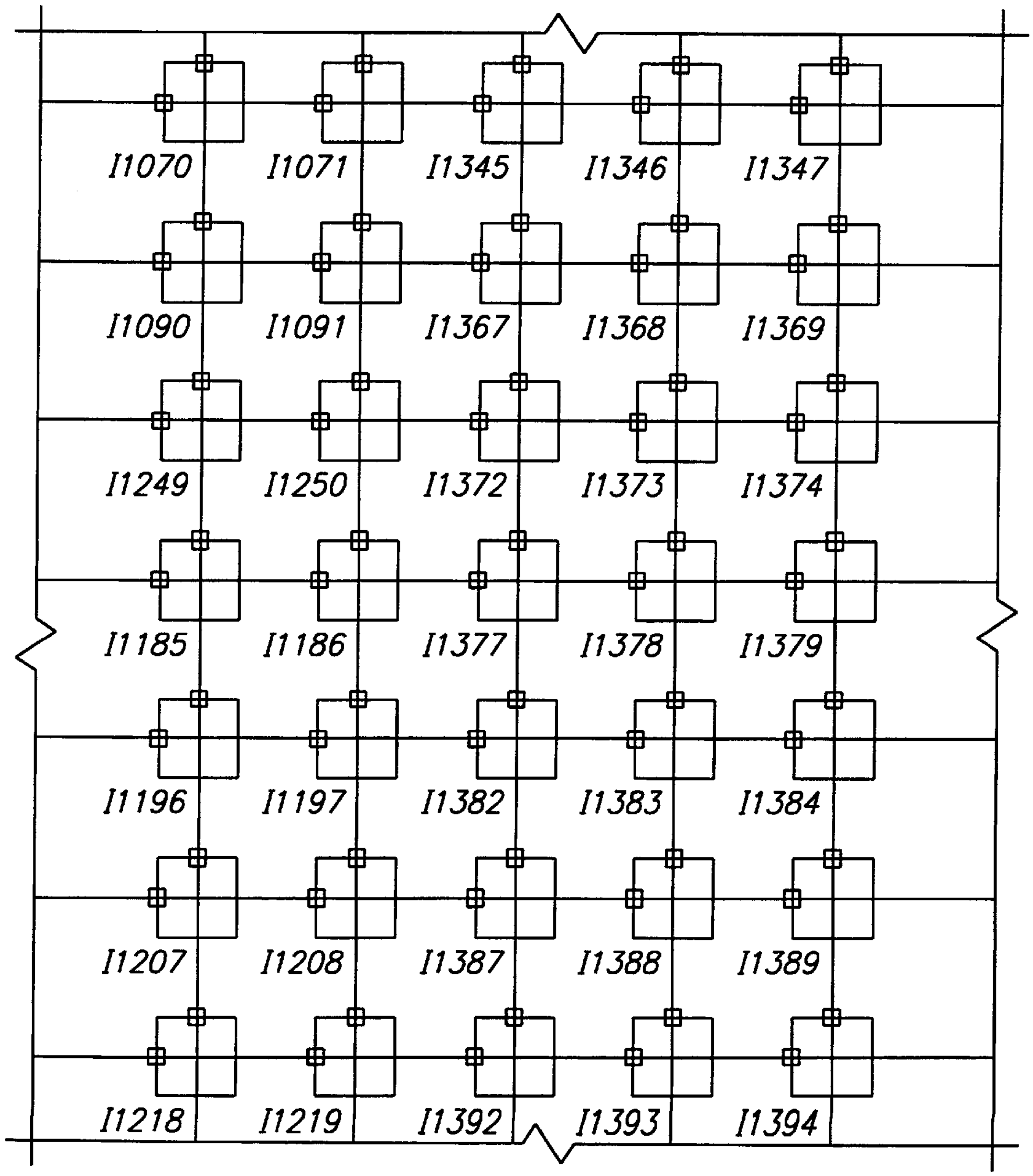
FIG 9.0103EE

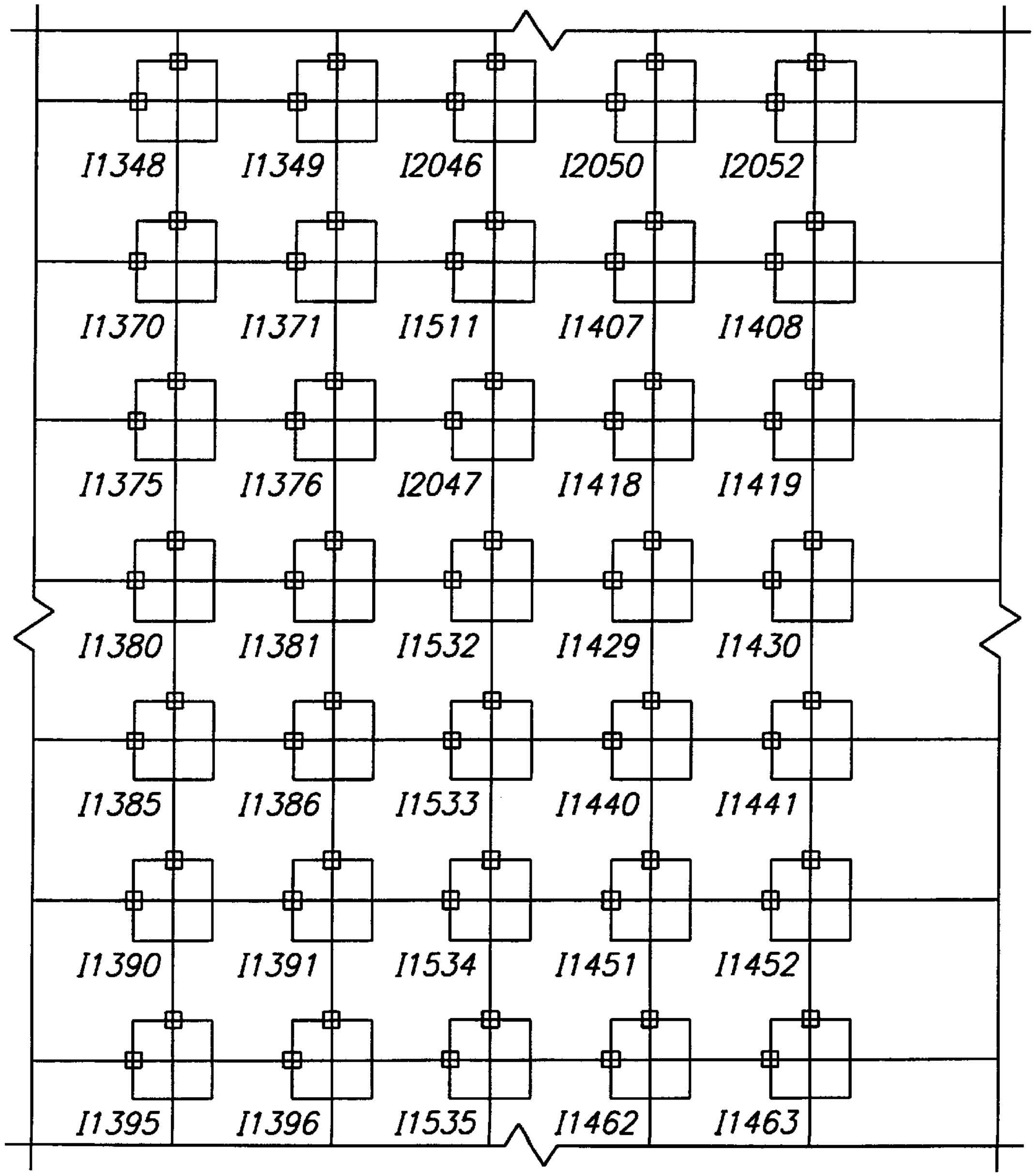
FIG. 9.01.03EF

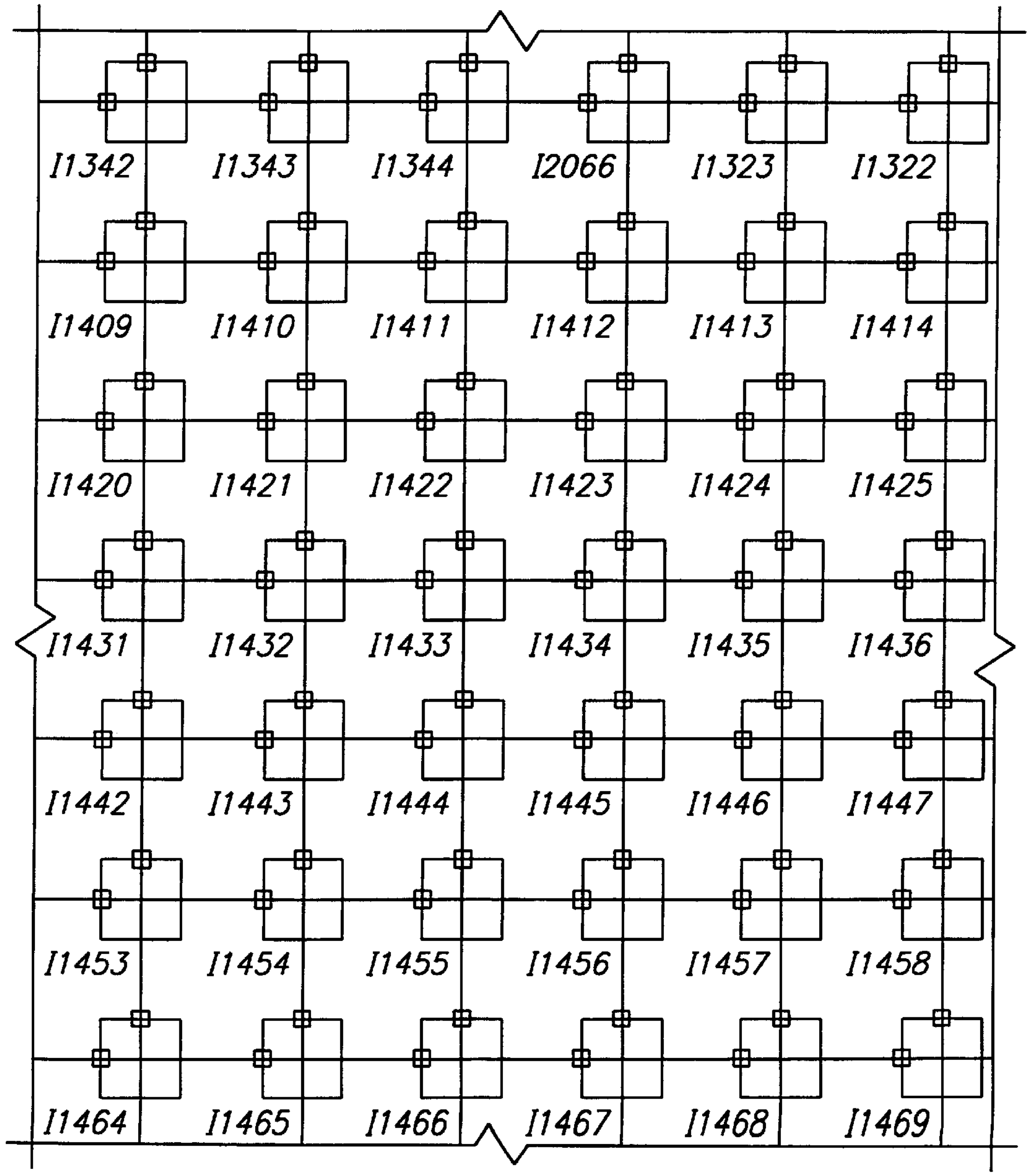
FIG. 9.0103EG

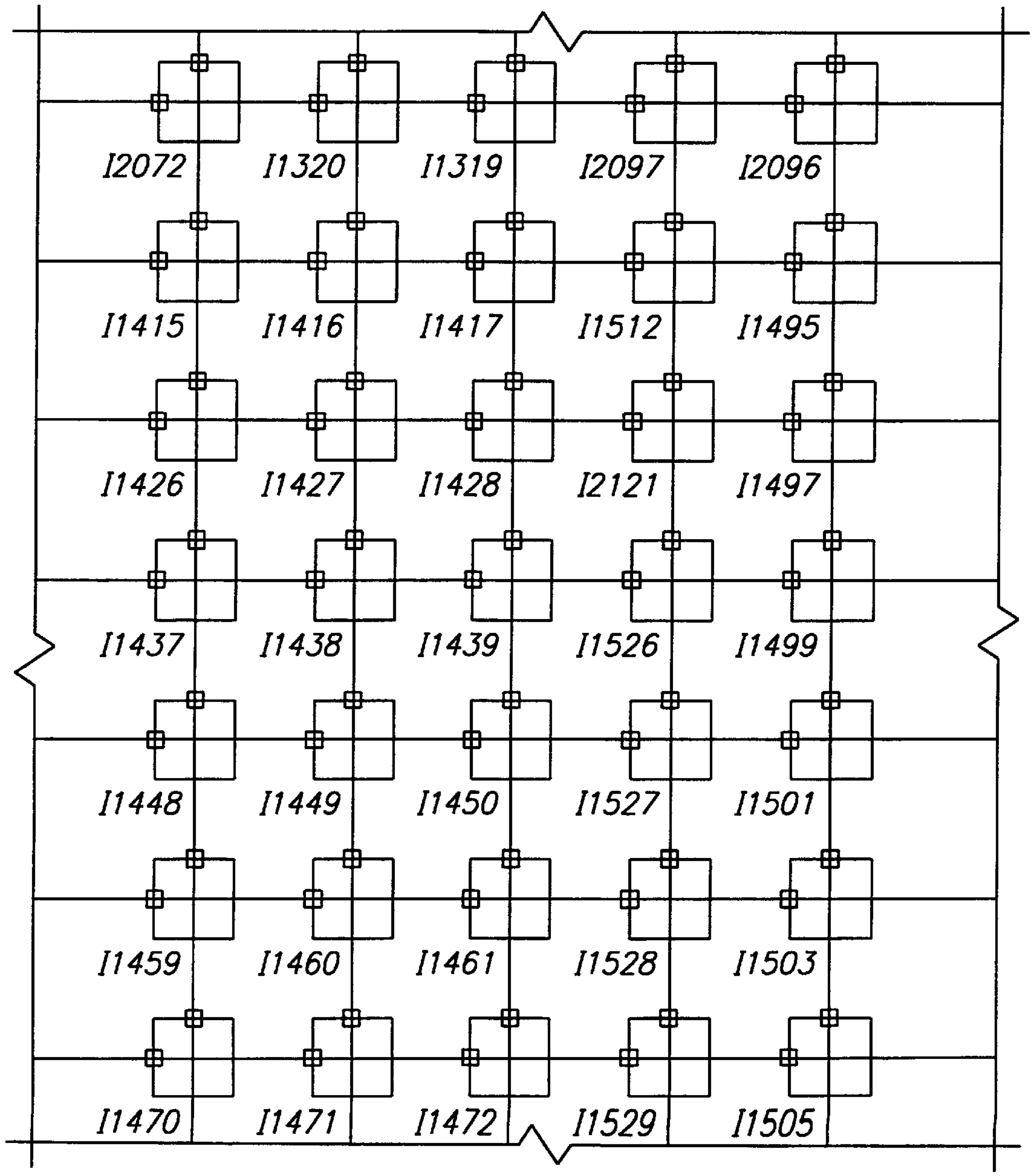
FIG. 9.01.03EH

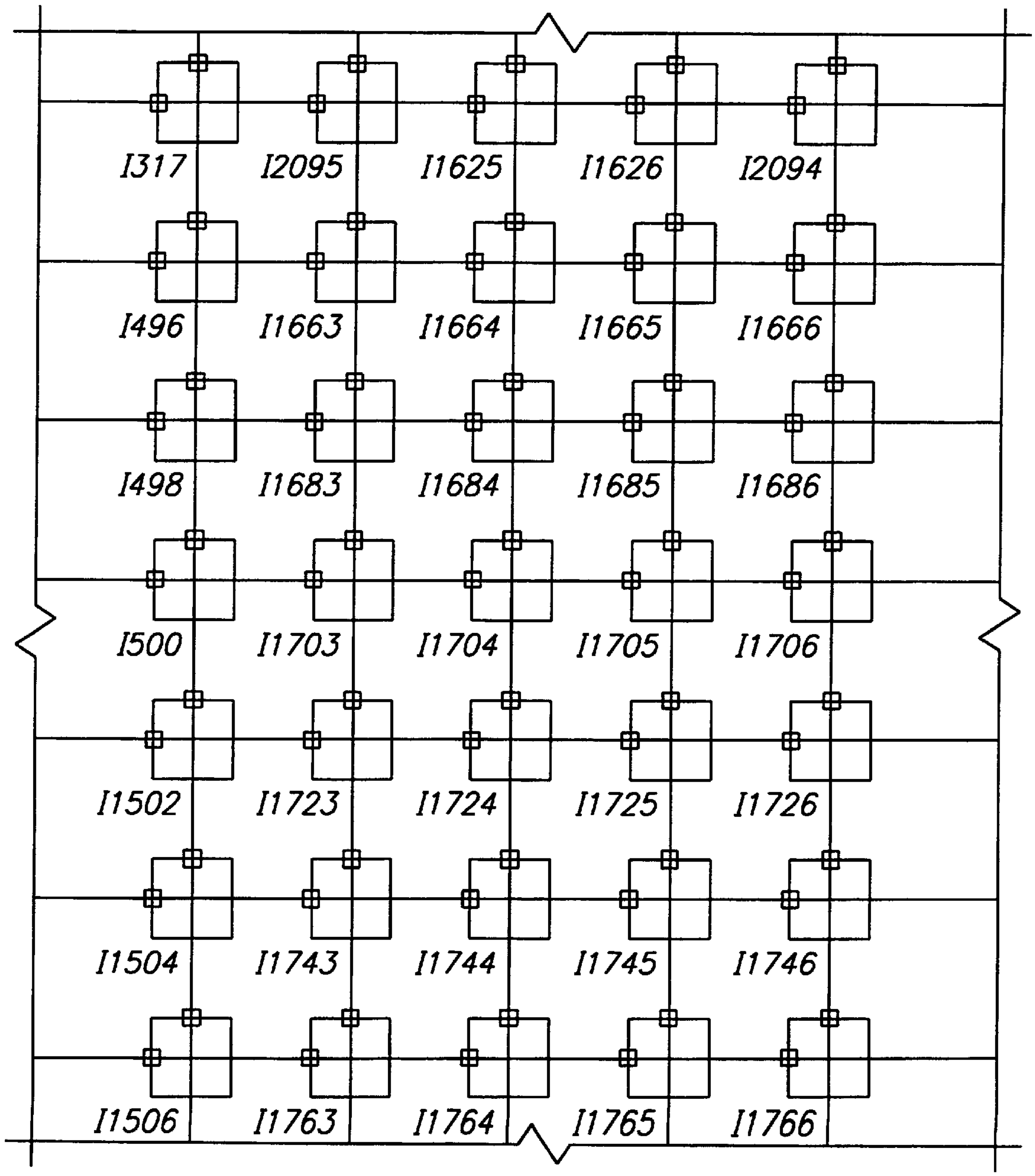
FIG 9.0103EI

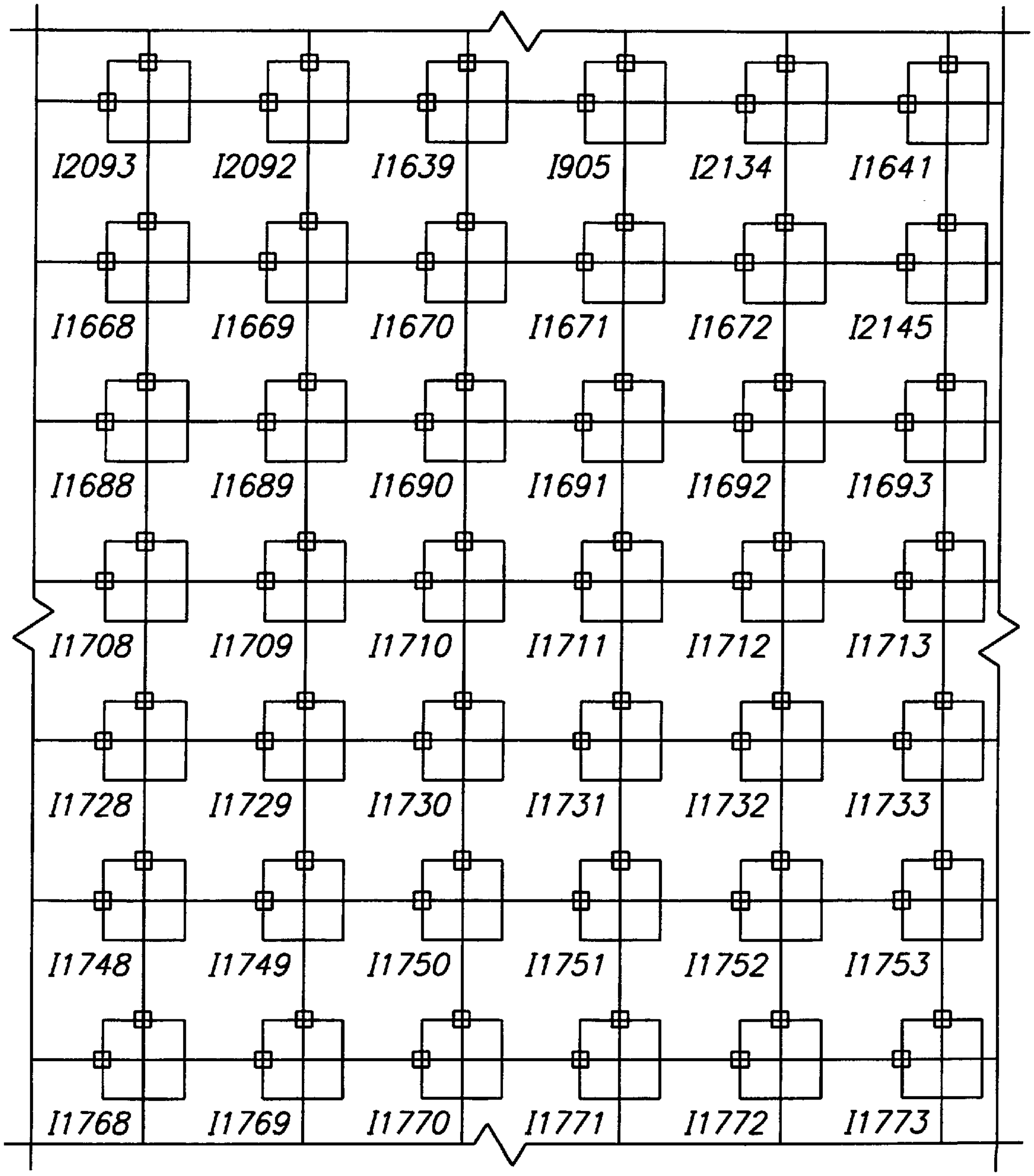
Fig 9.0103Ed

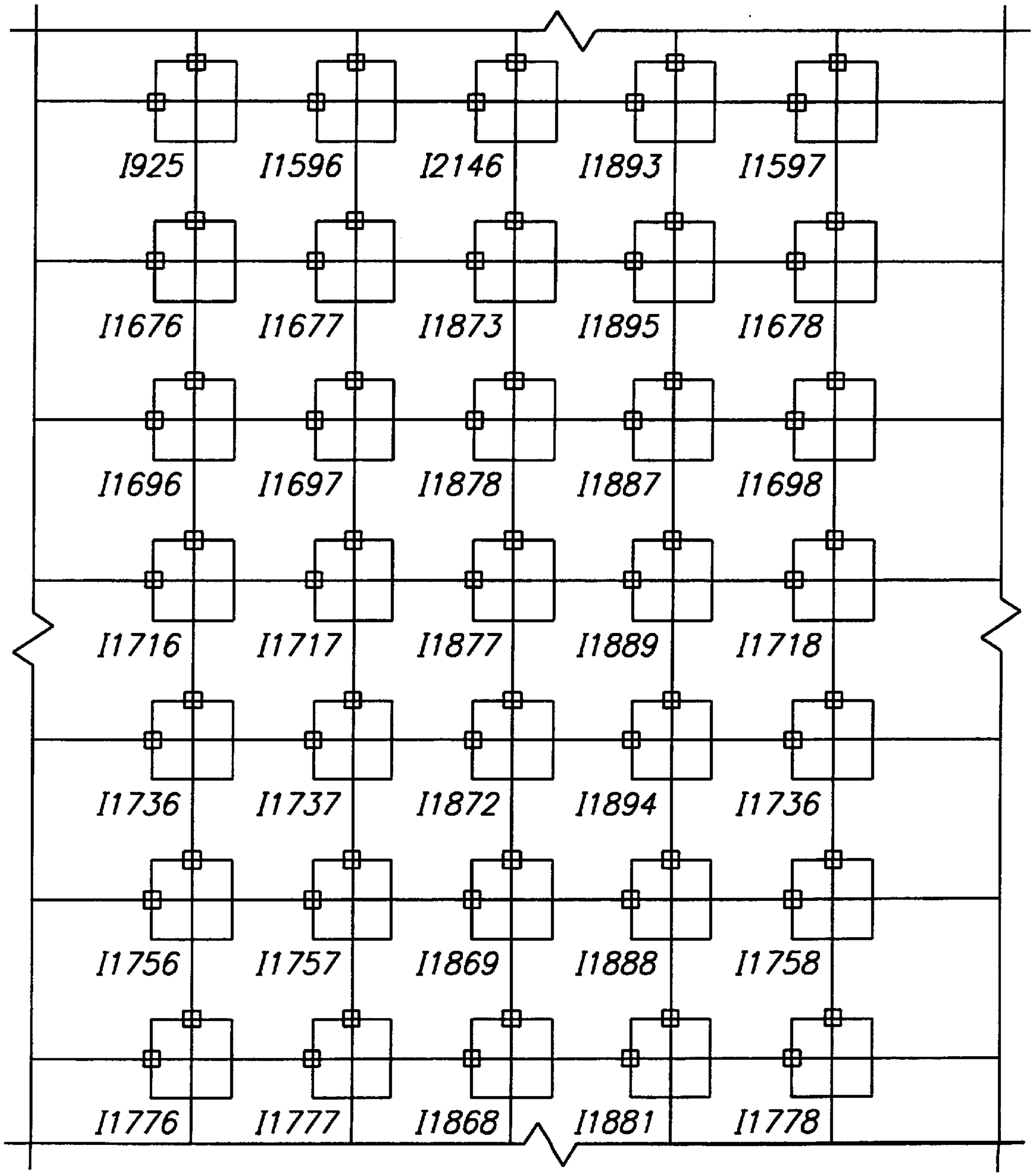
Fig 9.01103EK

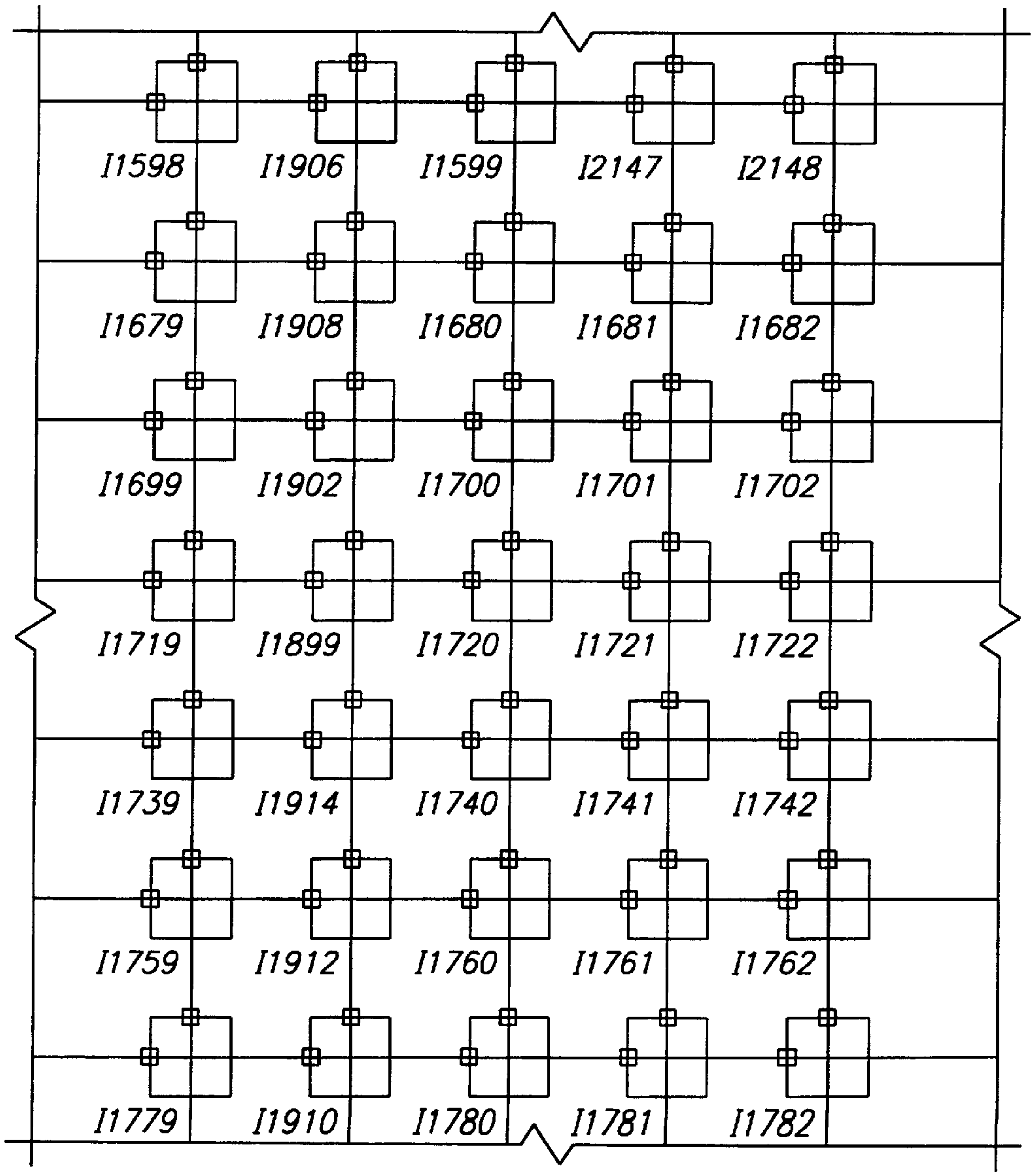
Fig 9.010 3EL

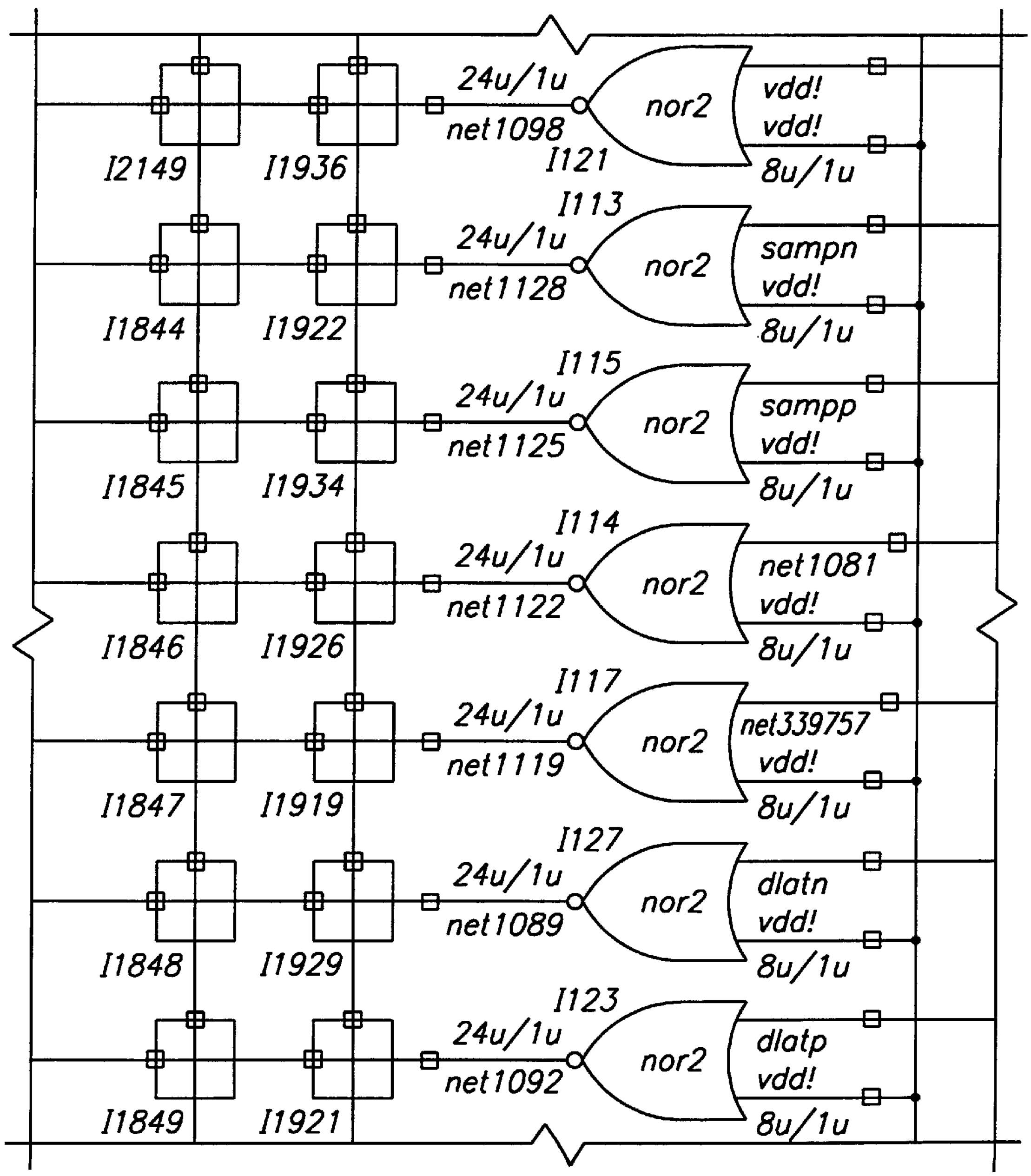
Fig 9.0103EM

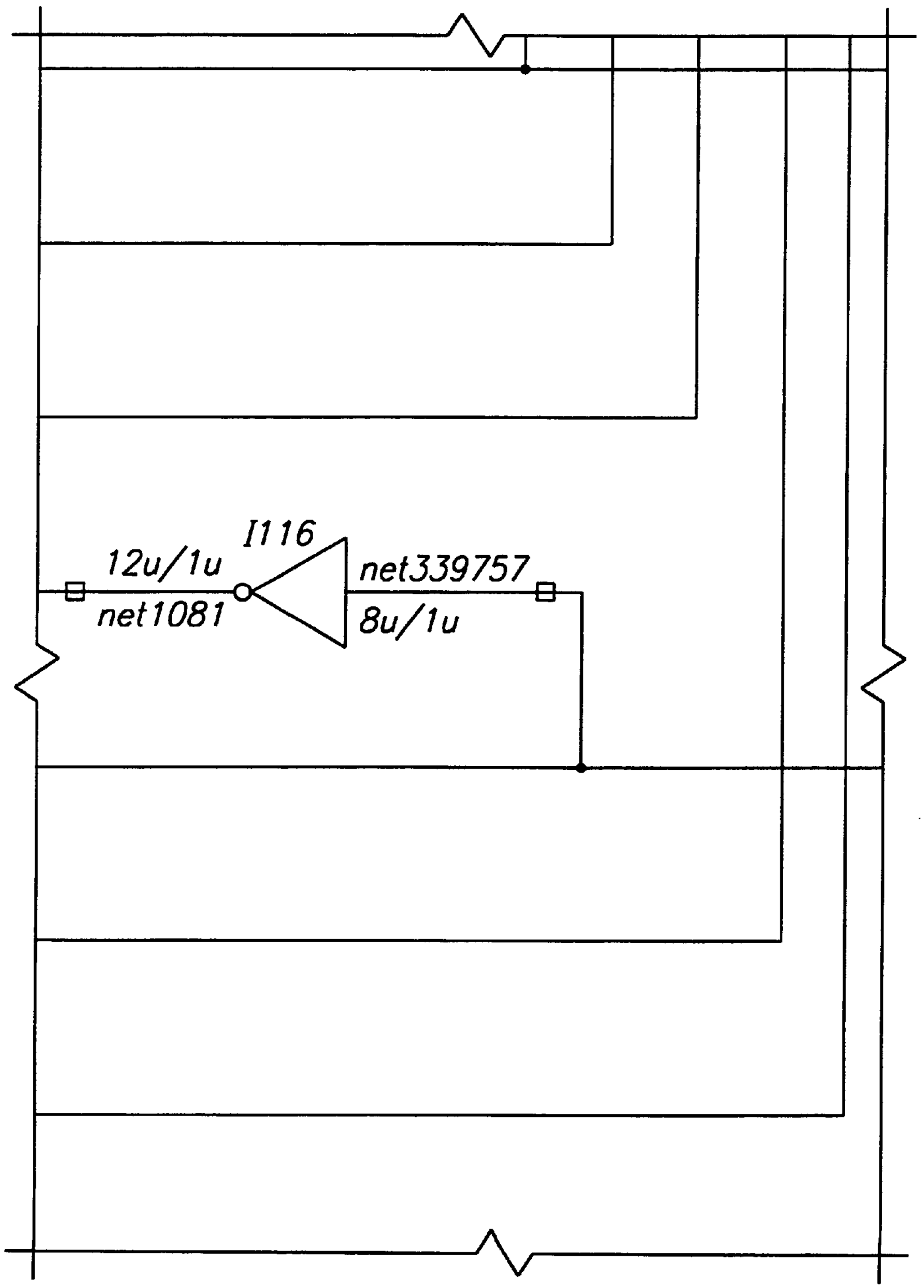
Fig. 9.01103EN

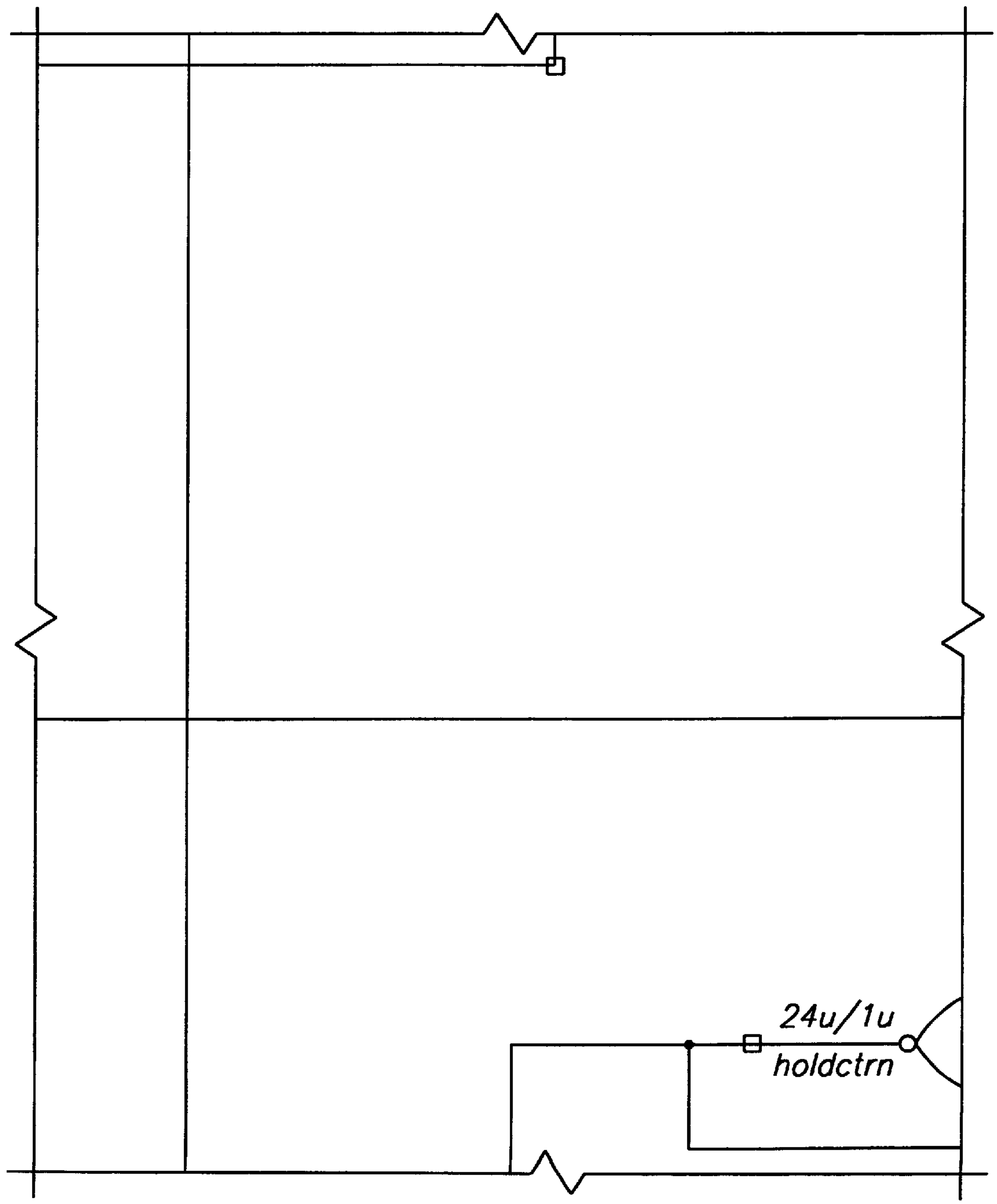
Fig 9.0103E0

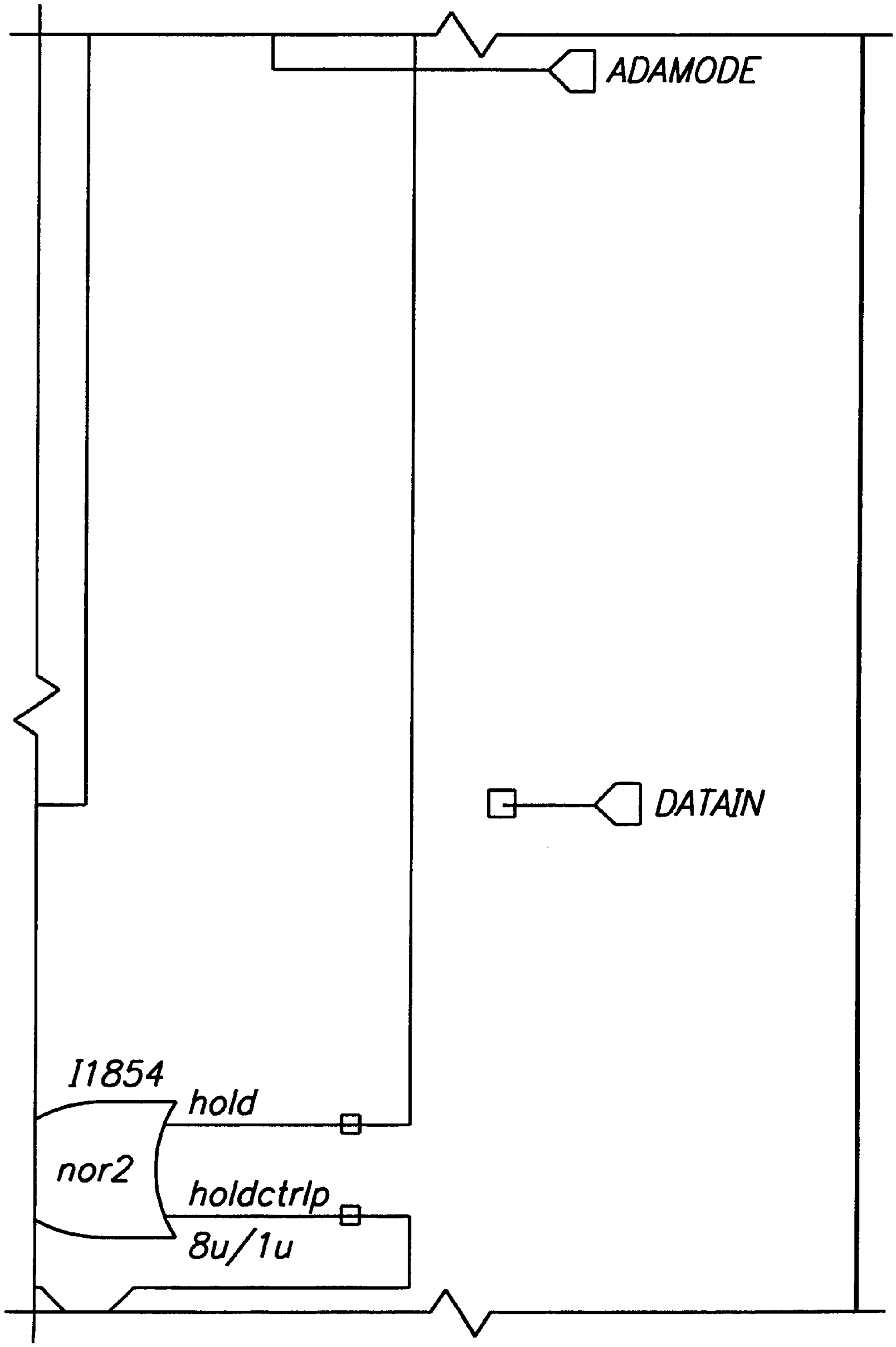
Fig 9.0103EP

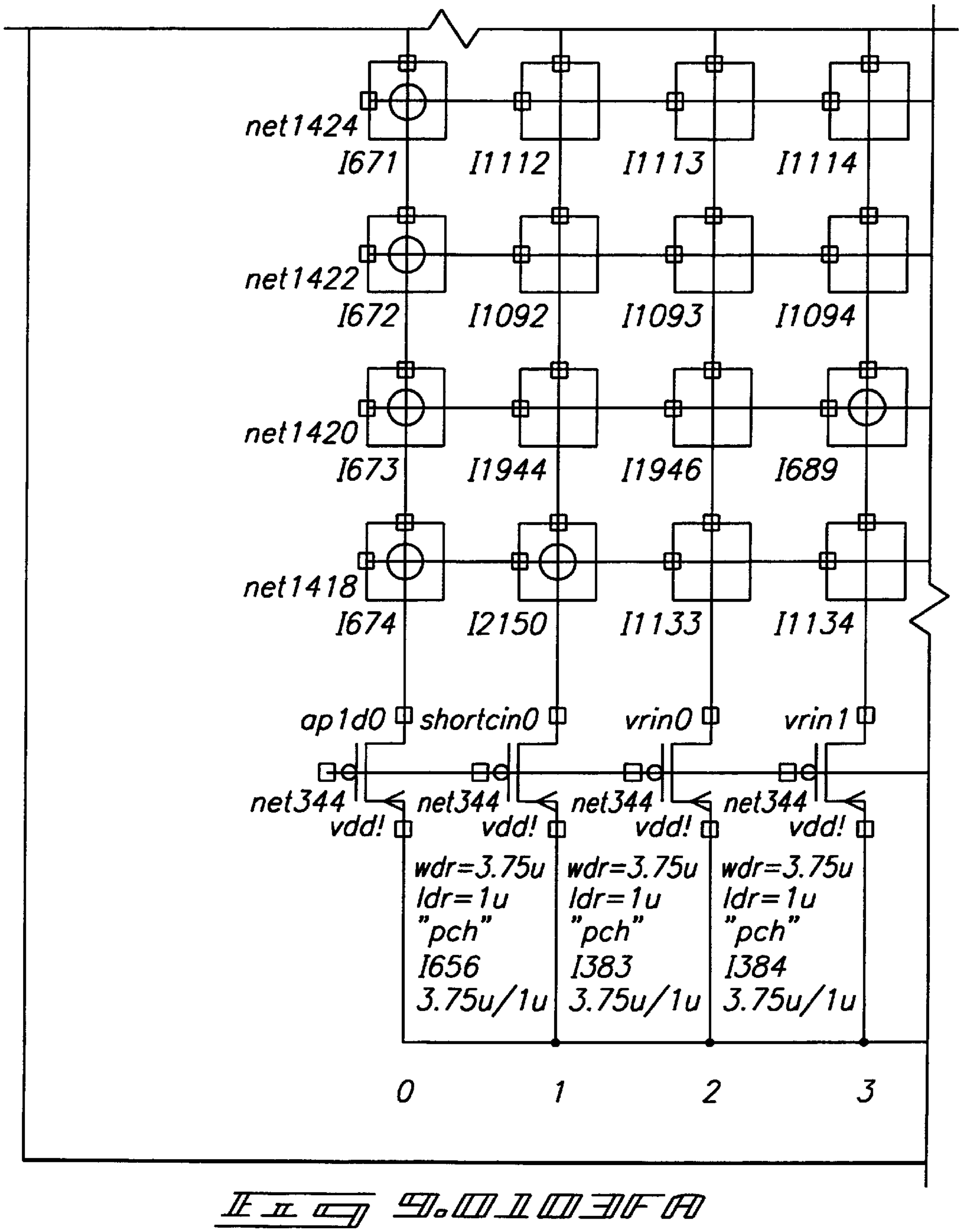
FIG 9.0103FA

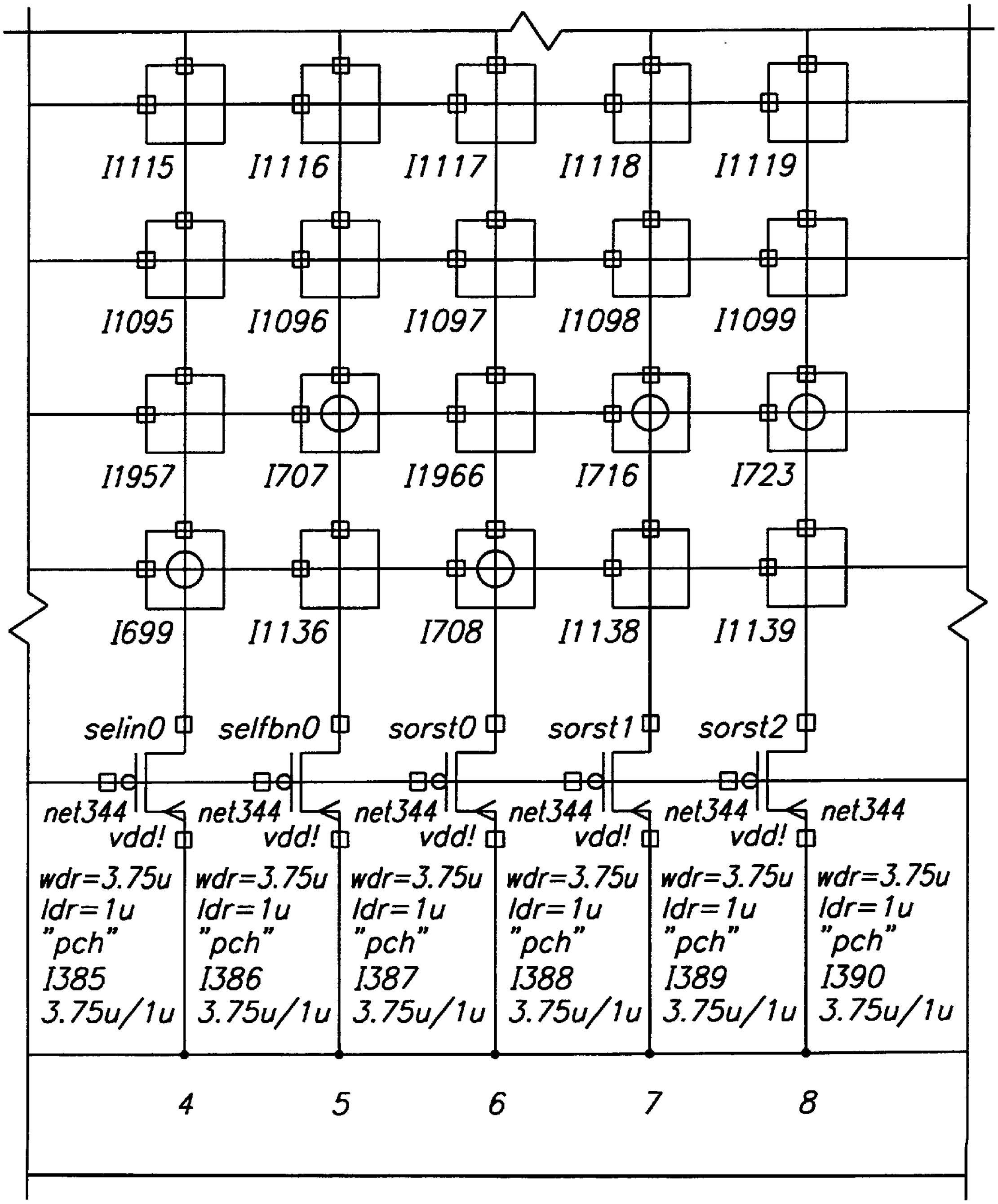
Fig 9.0103FB

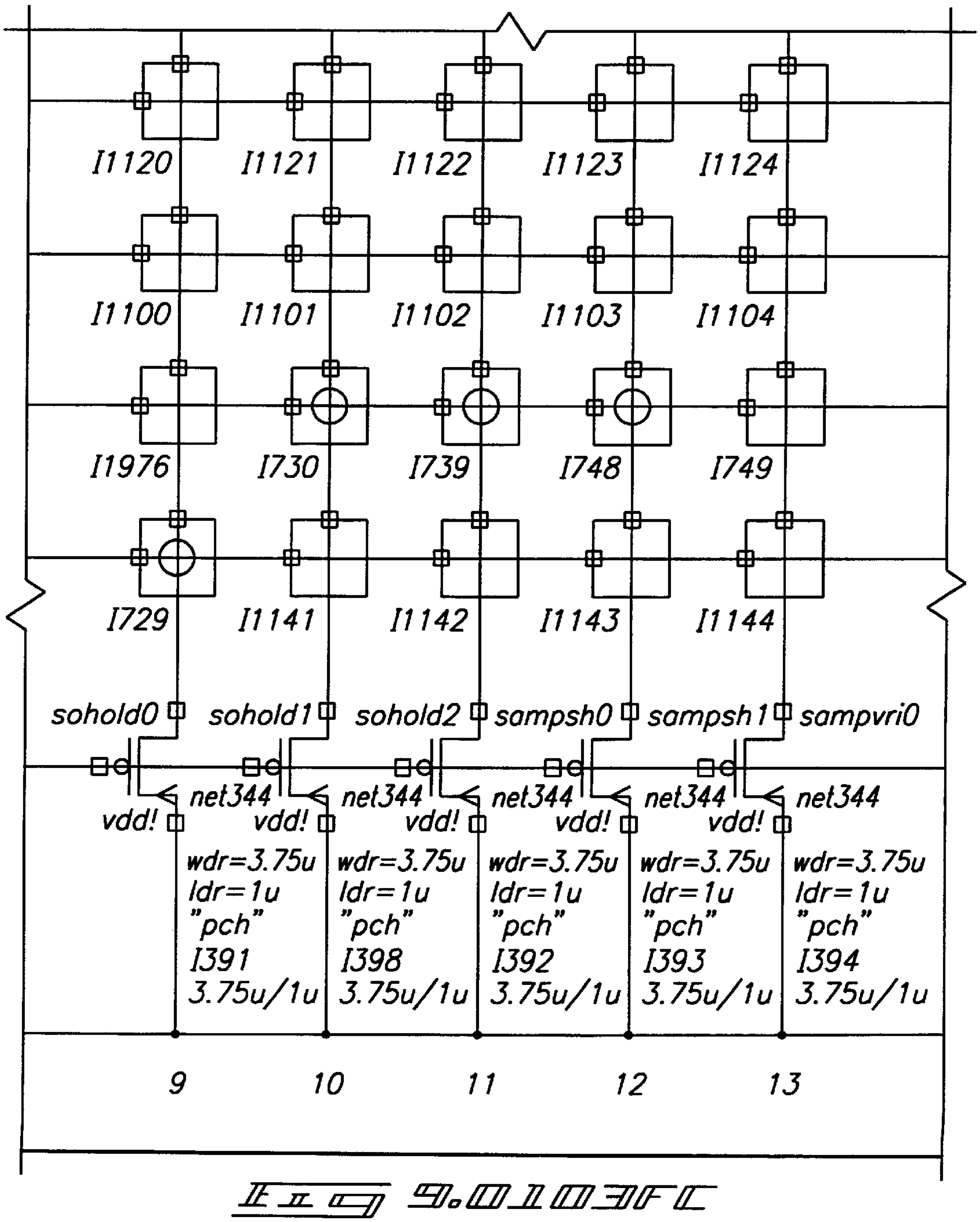
Fig. 9.0103FC

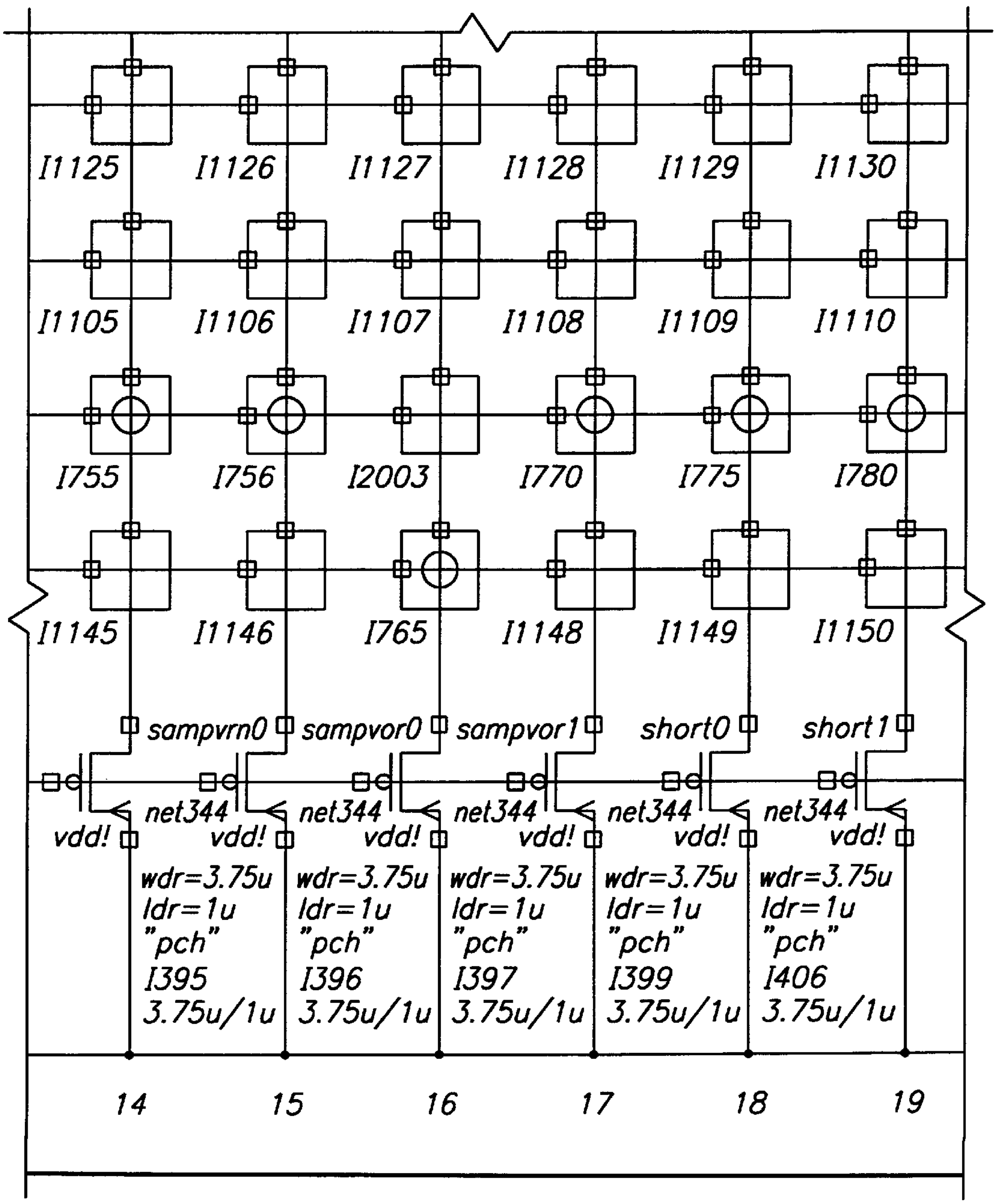
FIG 9.010.3FD

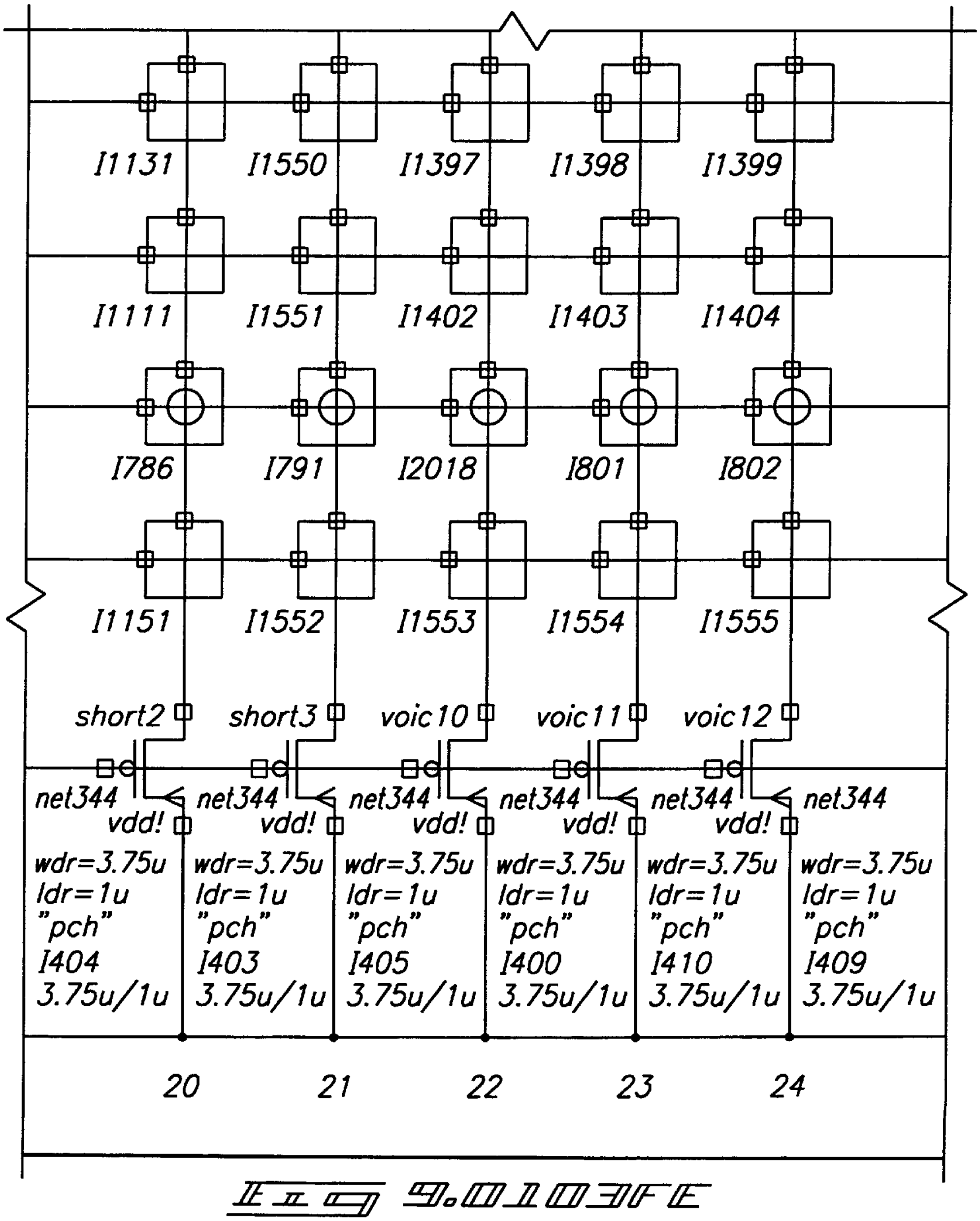
Fig. 9.01O3FE

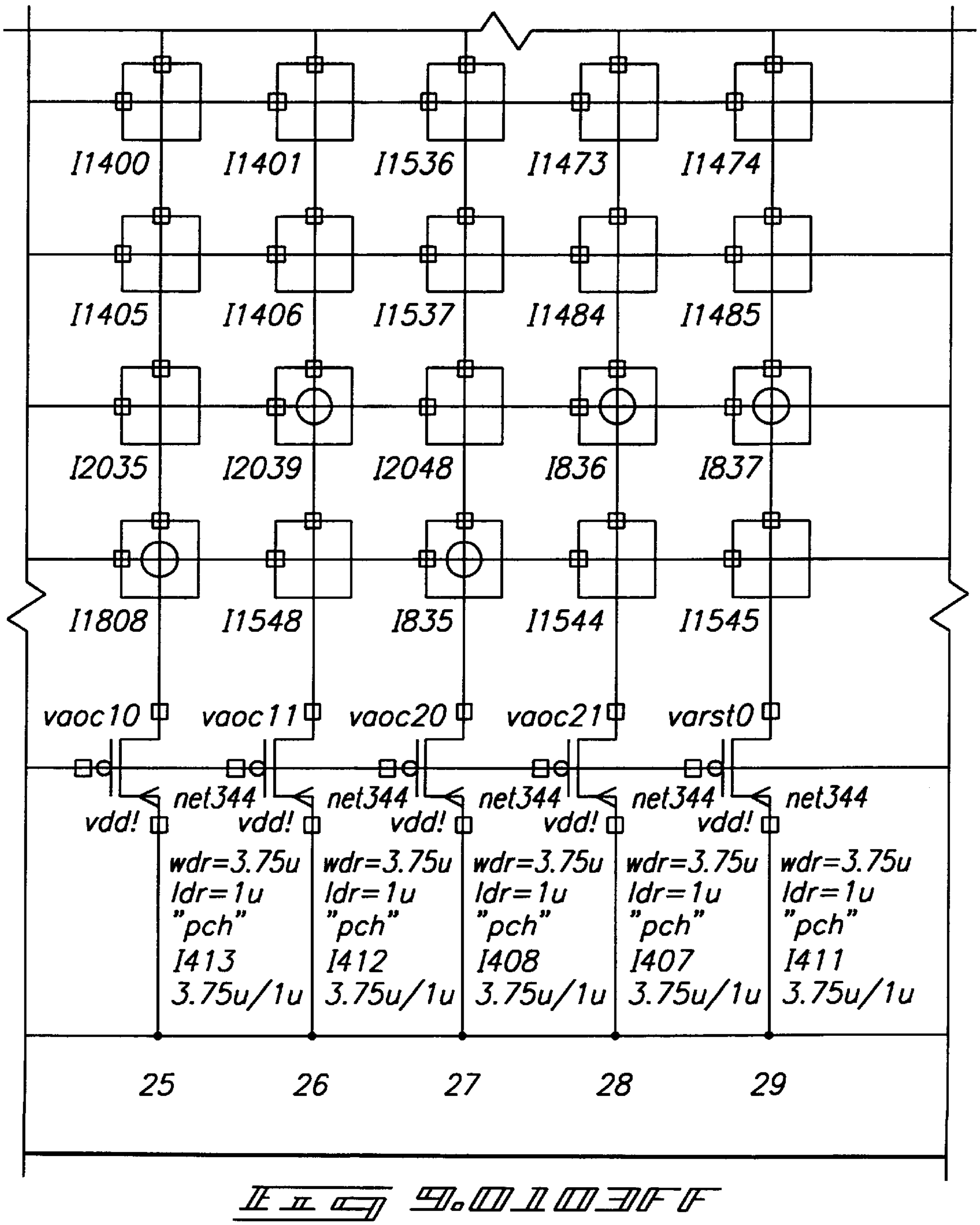
FIG. 9.01.03FF

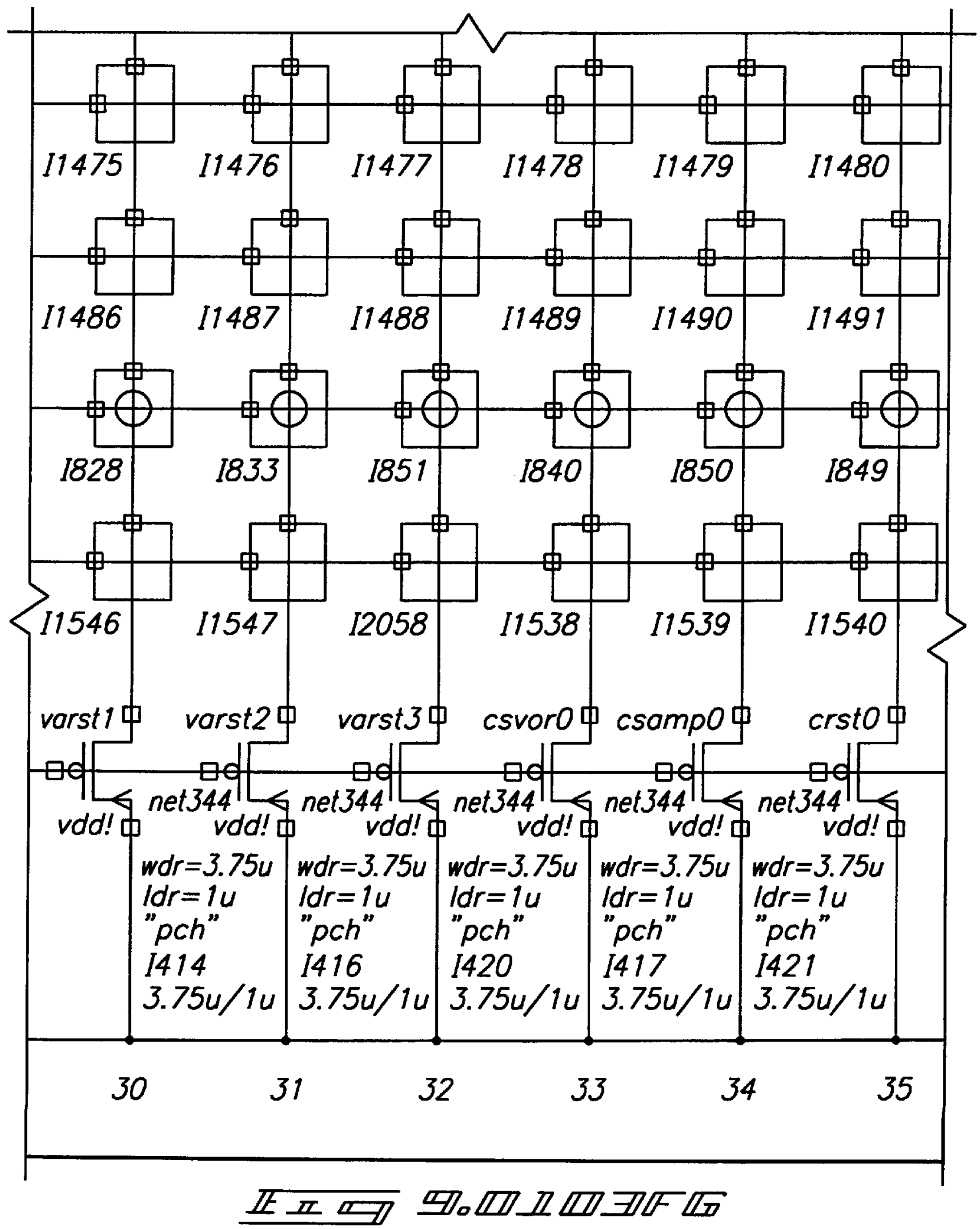
FIG 9.01103FG

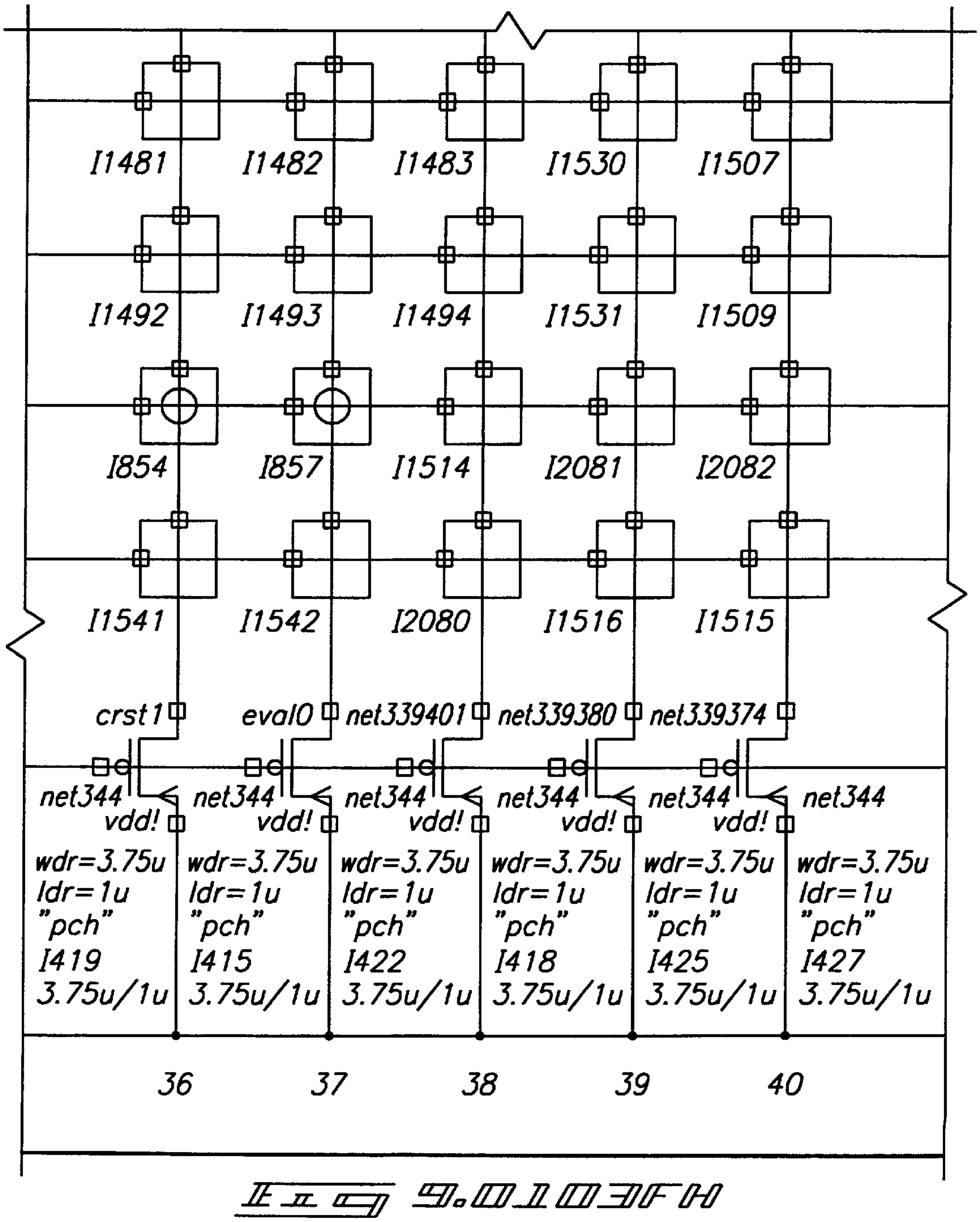
Fig 9.010.3FH

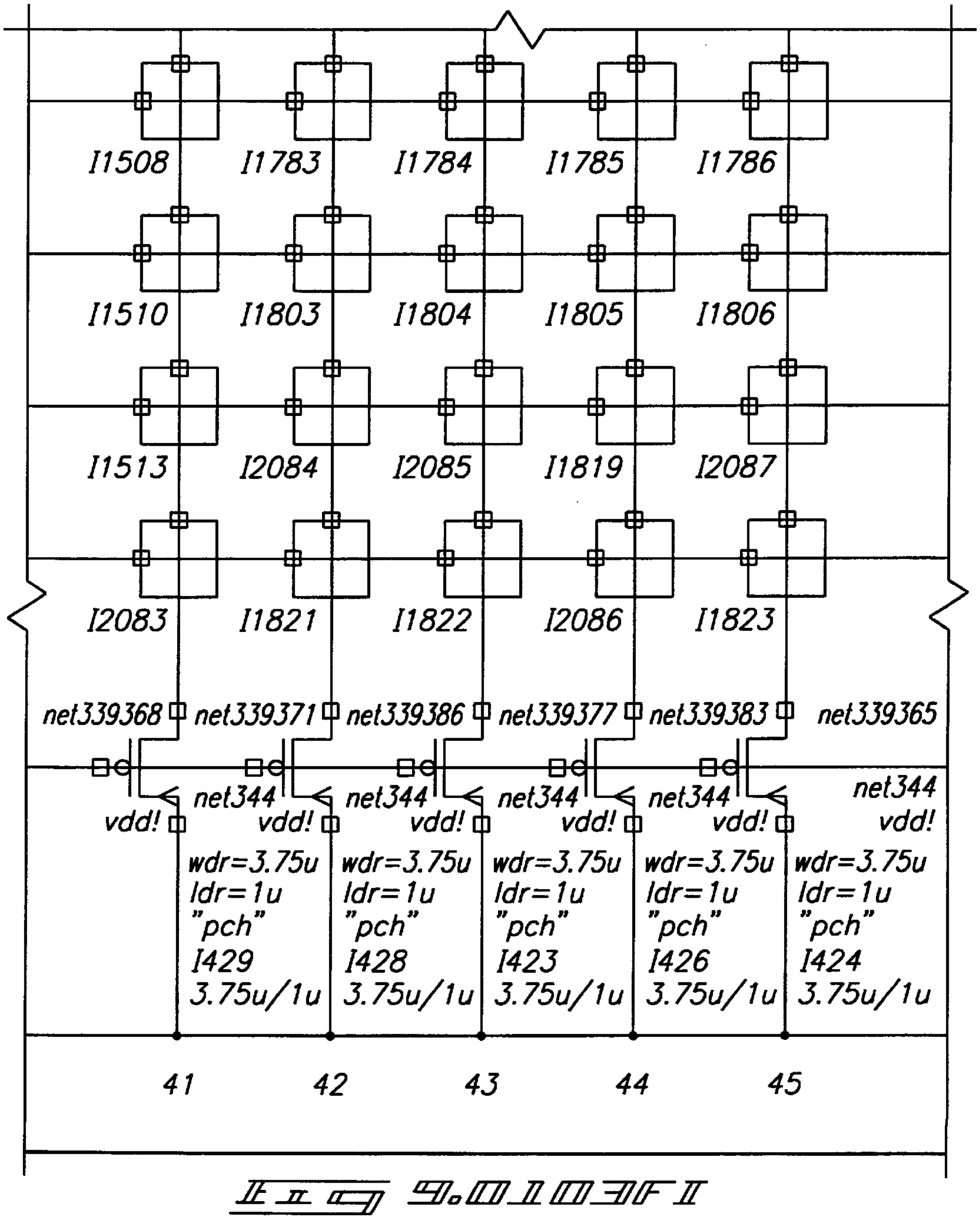
Fig 9.01.03F I

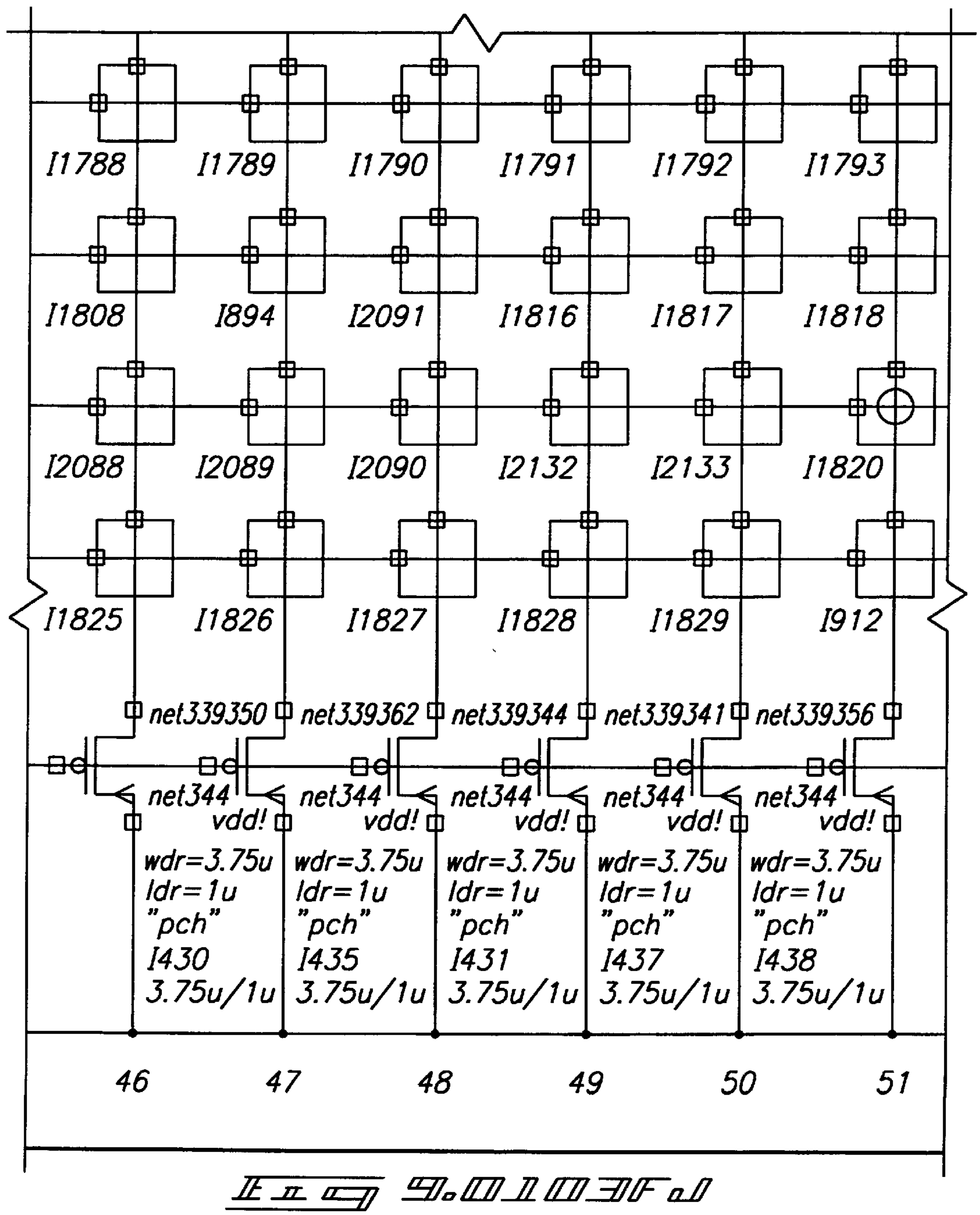
Fig. 9.01.03F.1

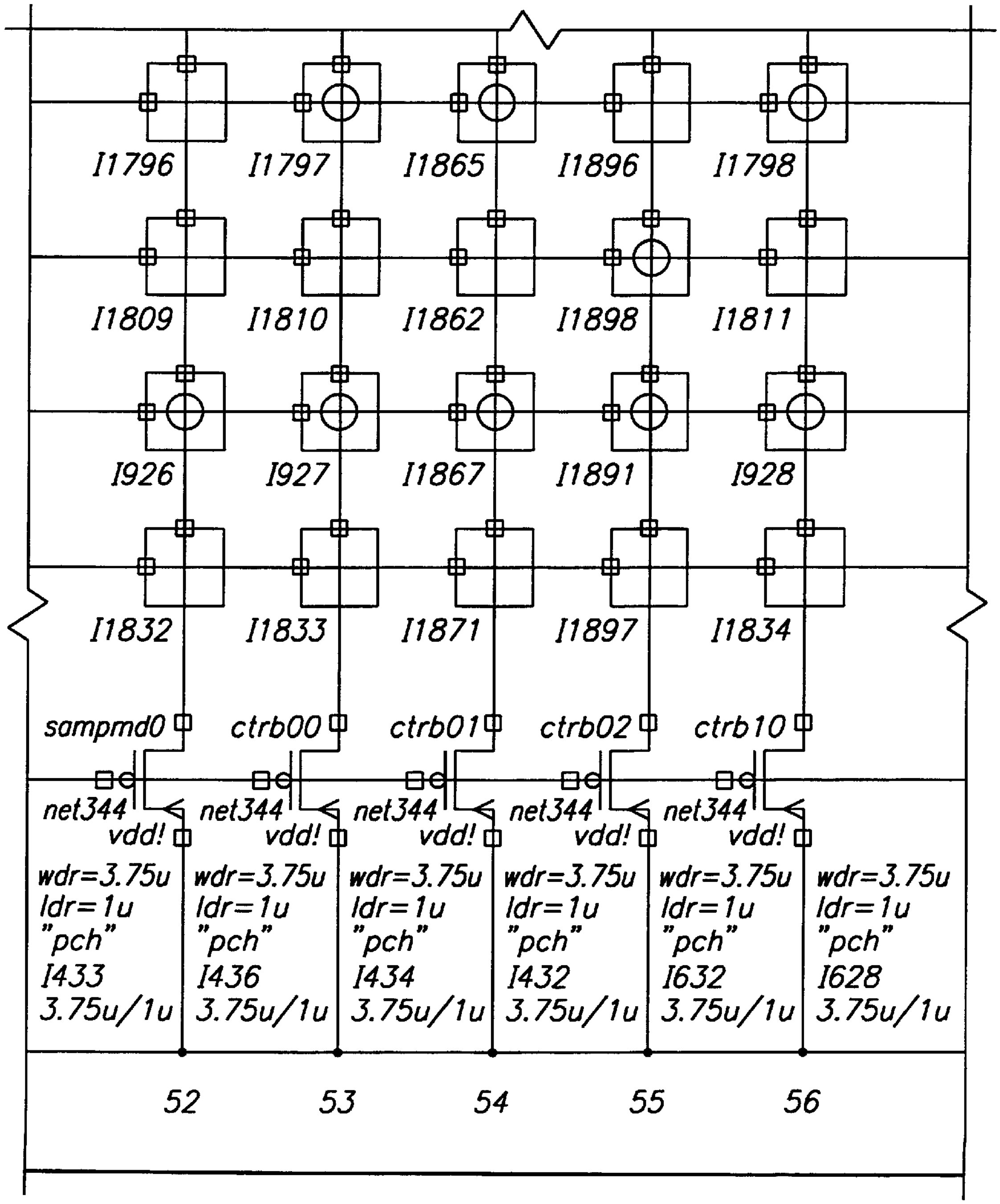
Fig 9.0103FK

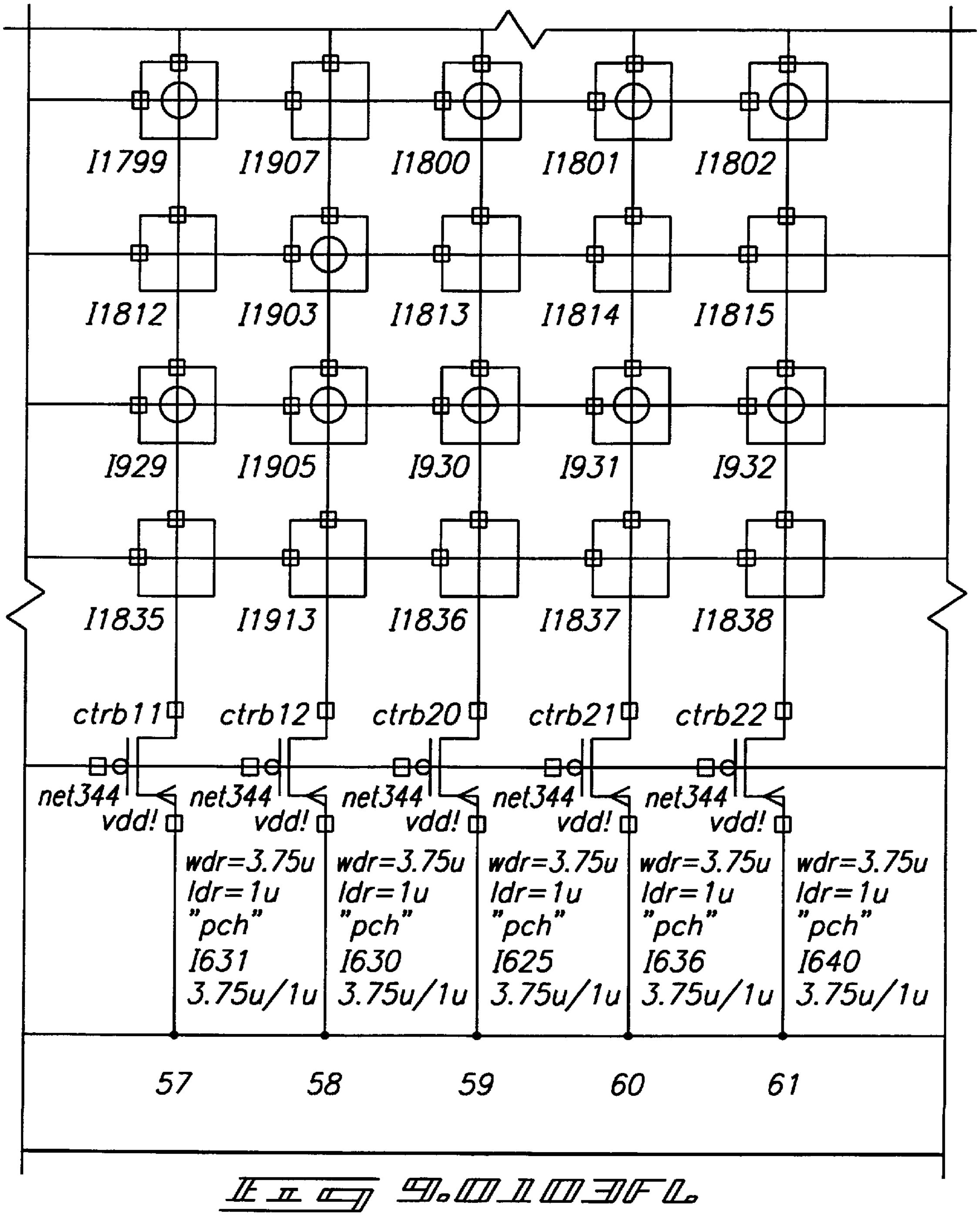
FIG. 9.010.3FL

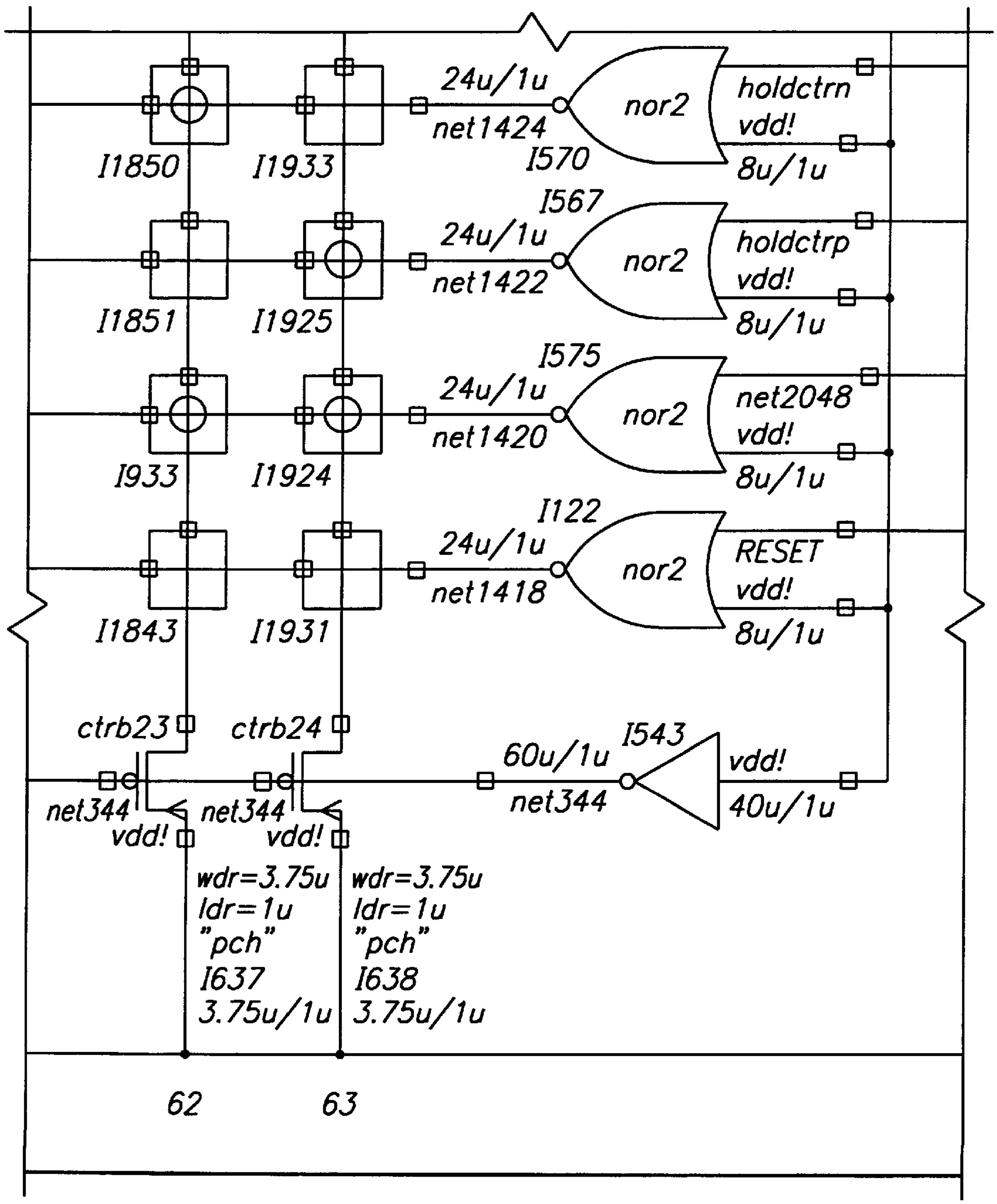
Fig 9.01.03FM

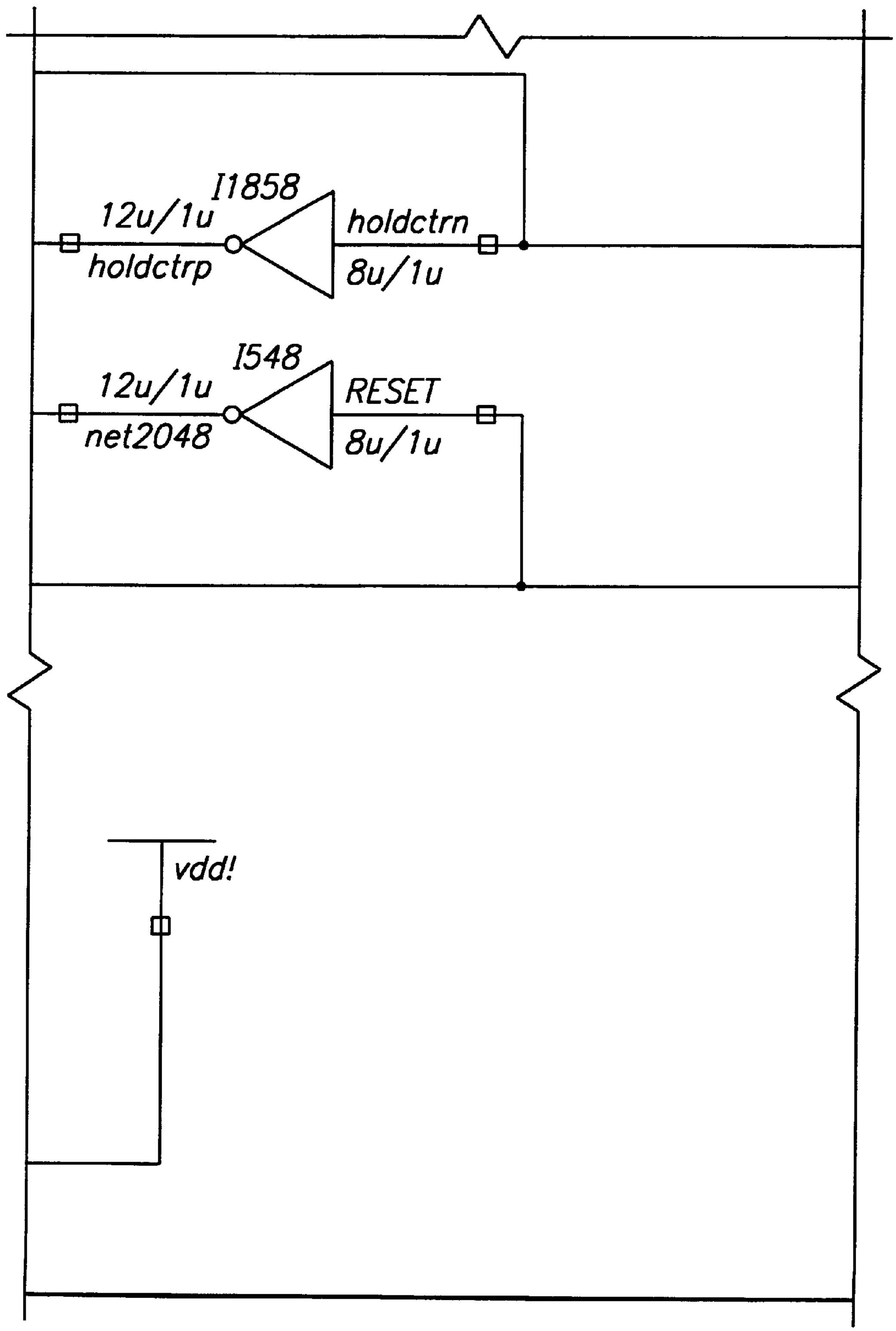
FIG. 9.01103FN

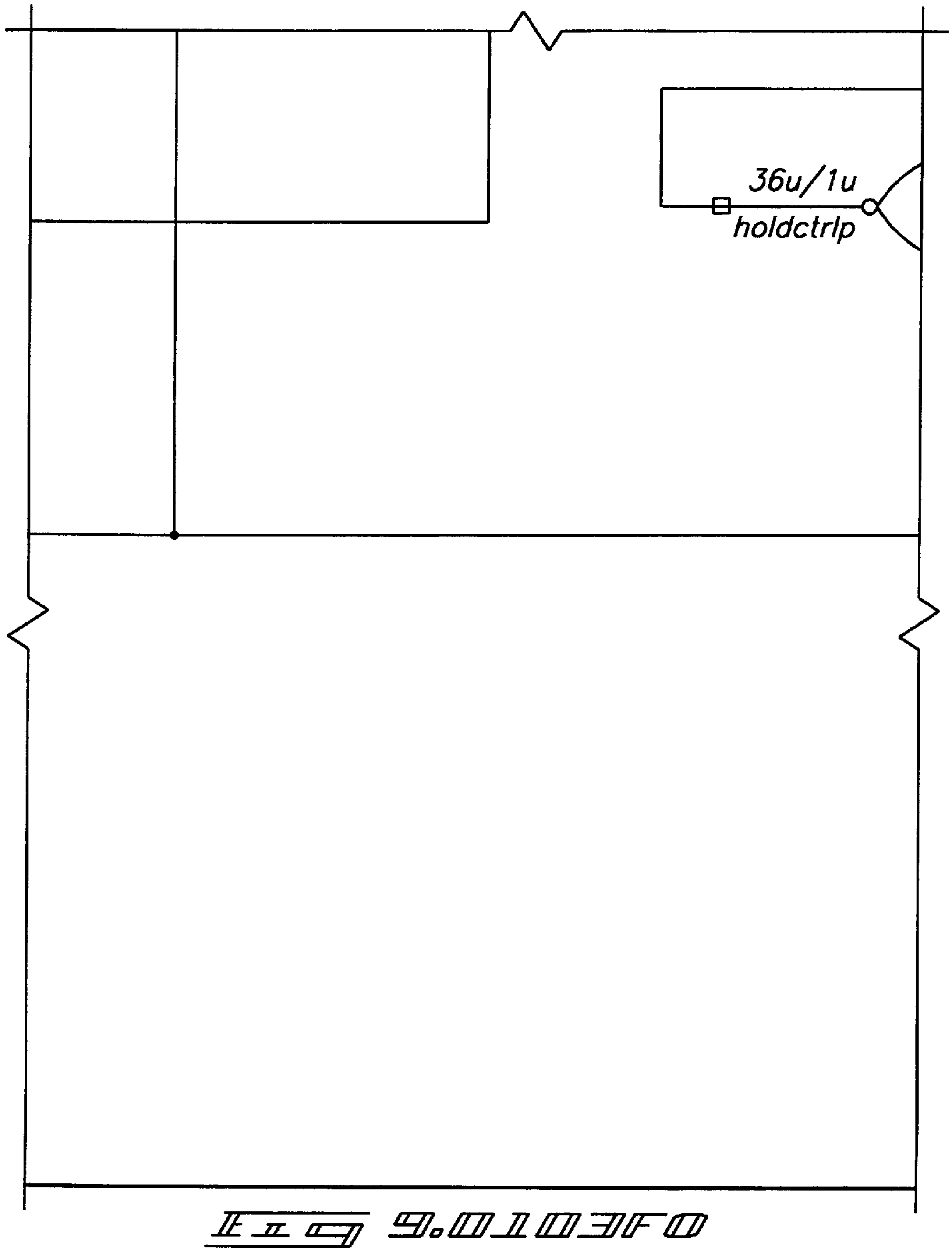
Fig 9.0103FO

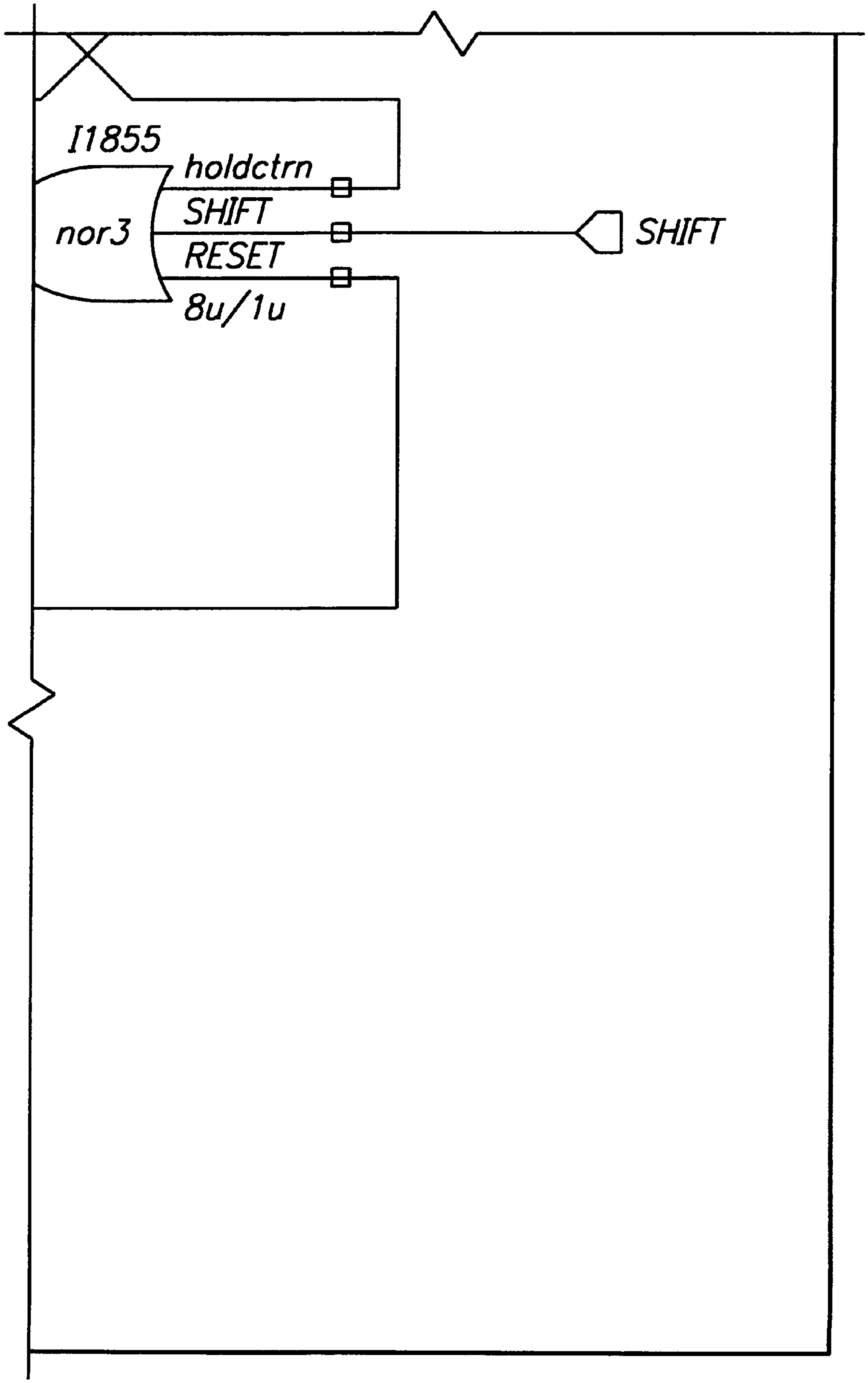
Fig 9.0103FP

| | | |
|---|---|---|
| 9.010301AA | 9.010301AB | 9.010301AC |
| 9.010301BA | 9.010301BB | 9.010301BC |
| 9.010301CA | 9.010301CB | 9.010301CC |

FIG. 9.010301

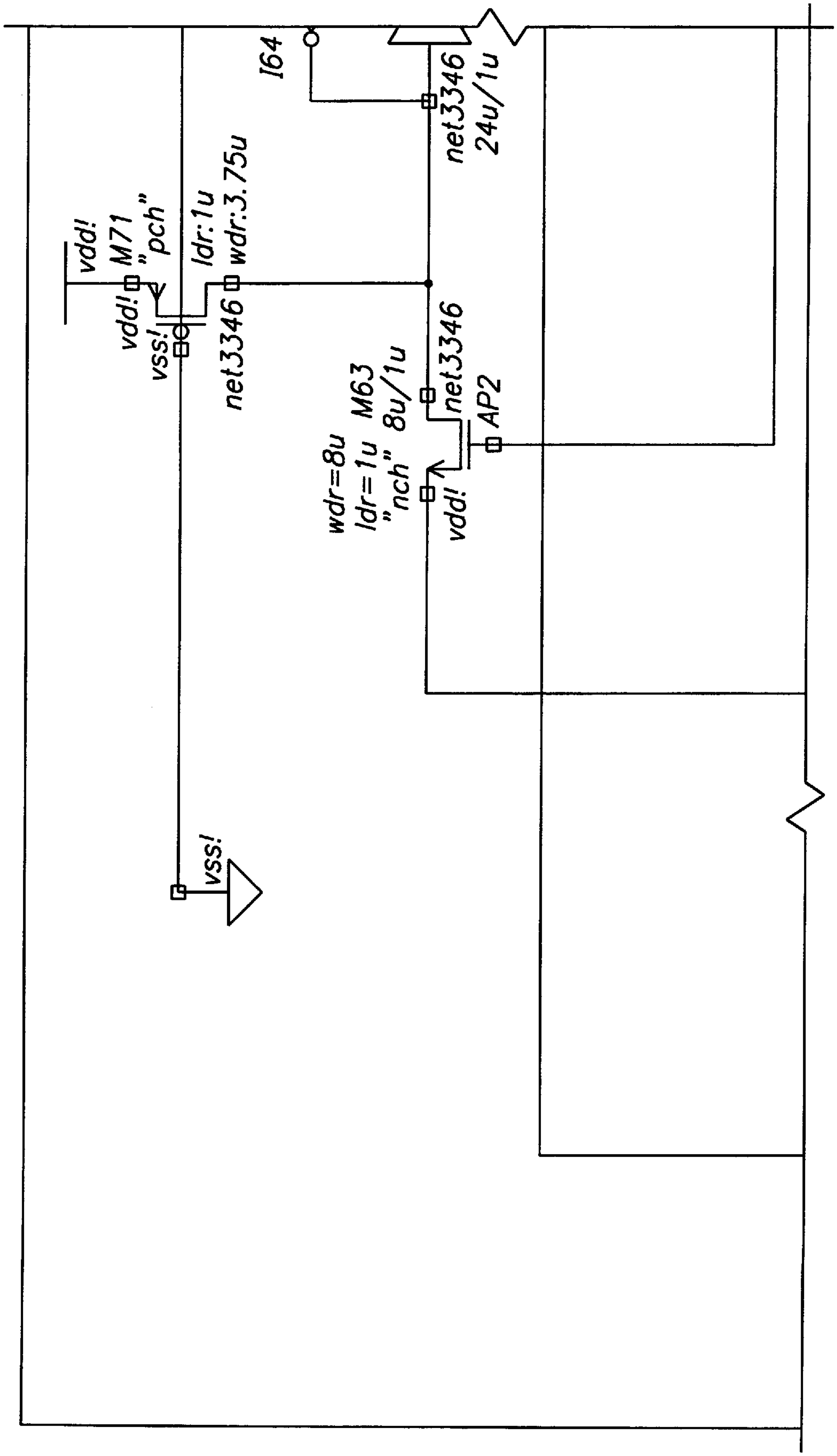
I64
net3346
24u/1u
vdd!
M71
"pch"
ldr:1u
wdr:3.75u
vdd!
vss!
net3346
net3346
M63
8u/1u
net3346
AP2
wdr=8u
ldr=1u
"nch"
vdd!
vss!

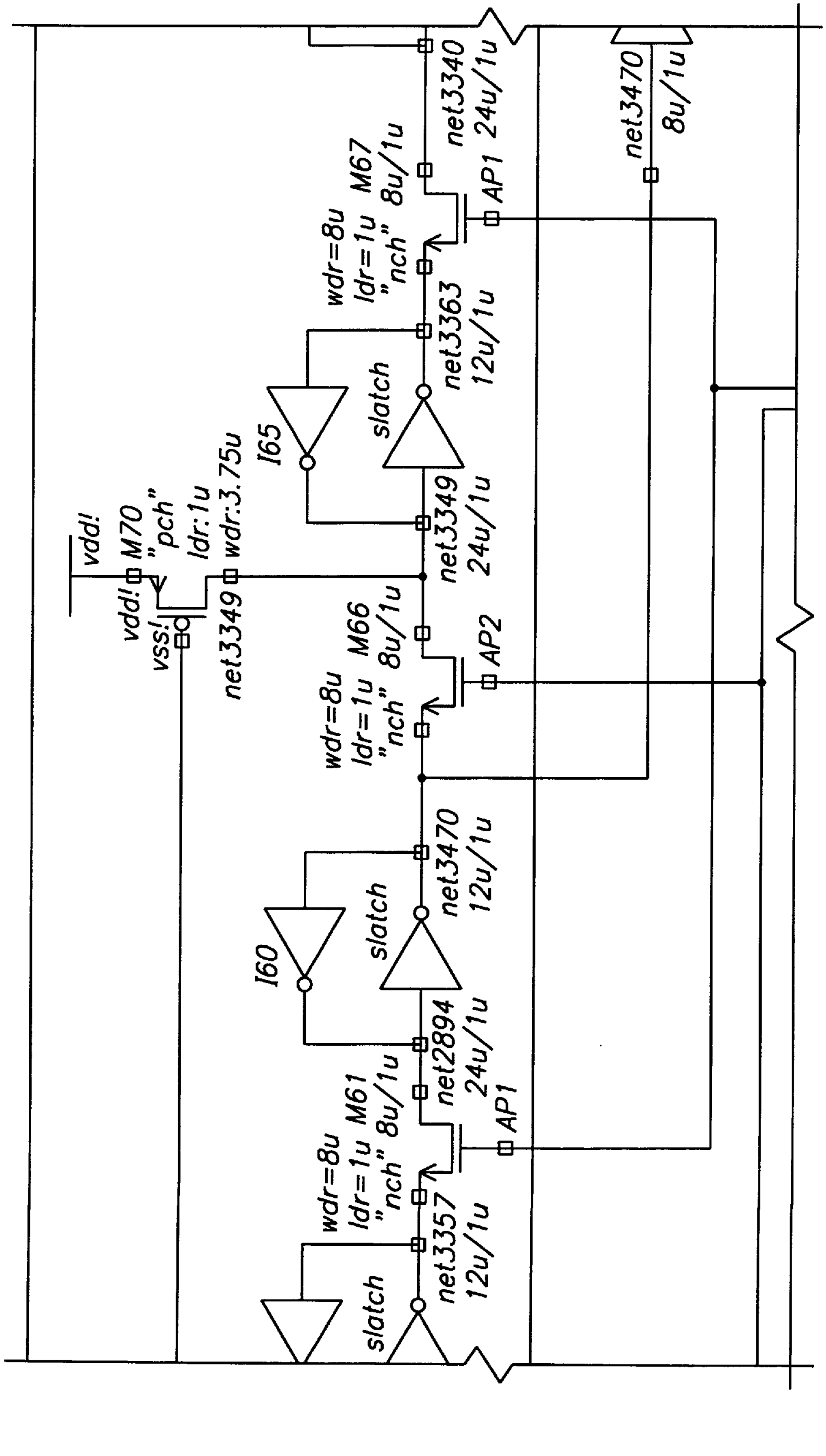
FIG. 9.010301AB

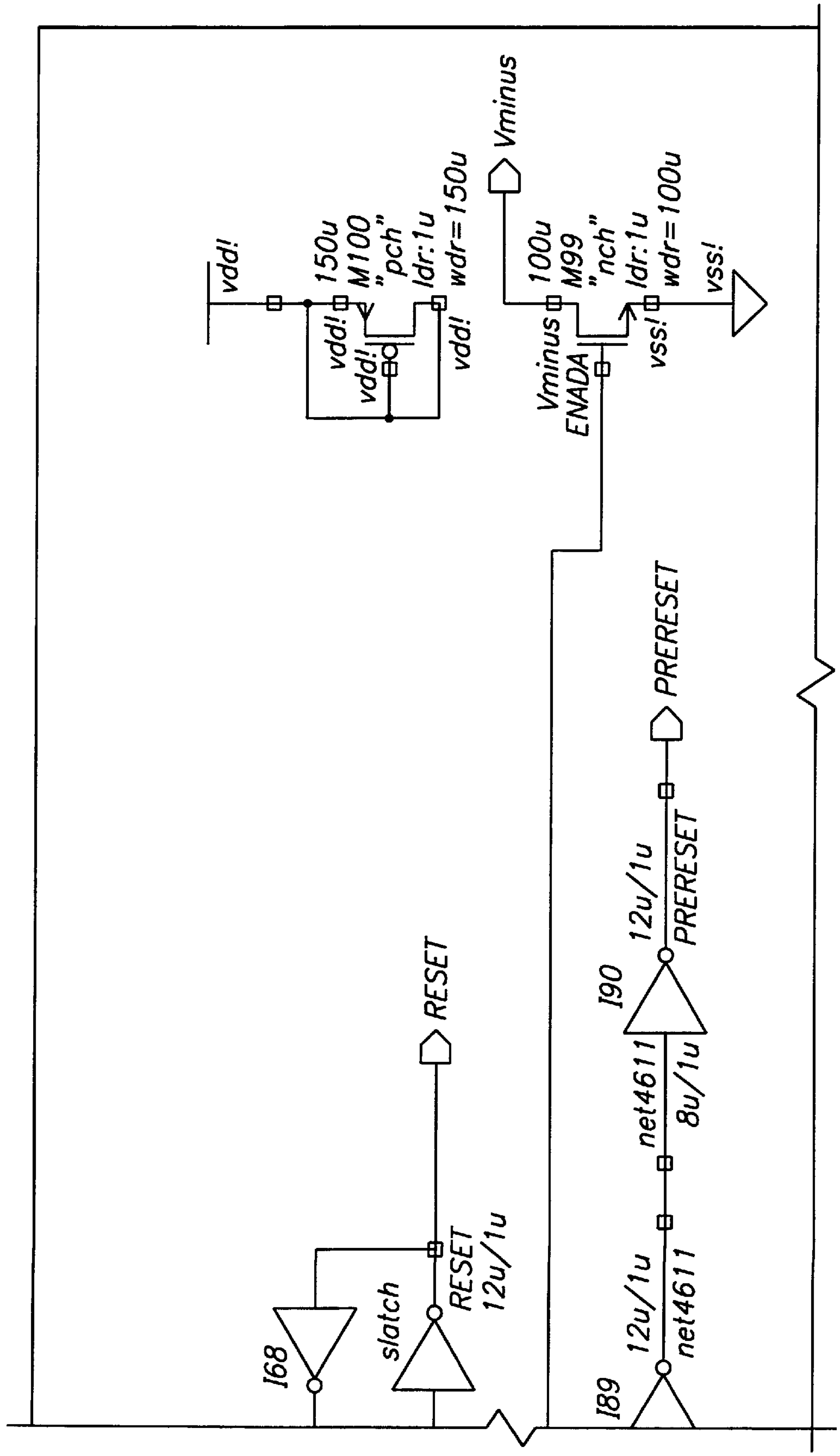
FIG 9.010301AC

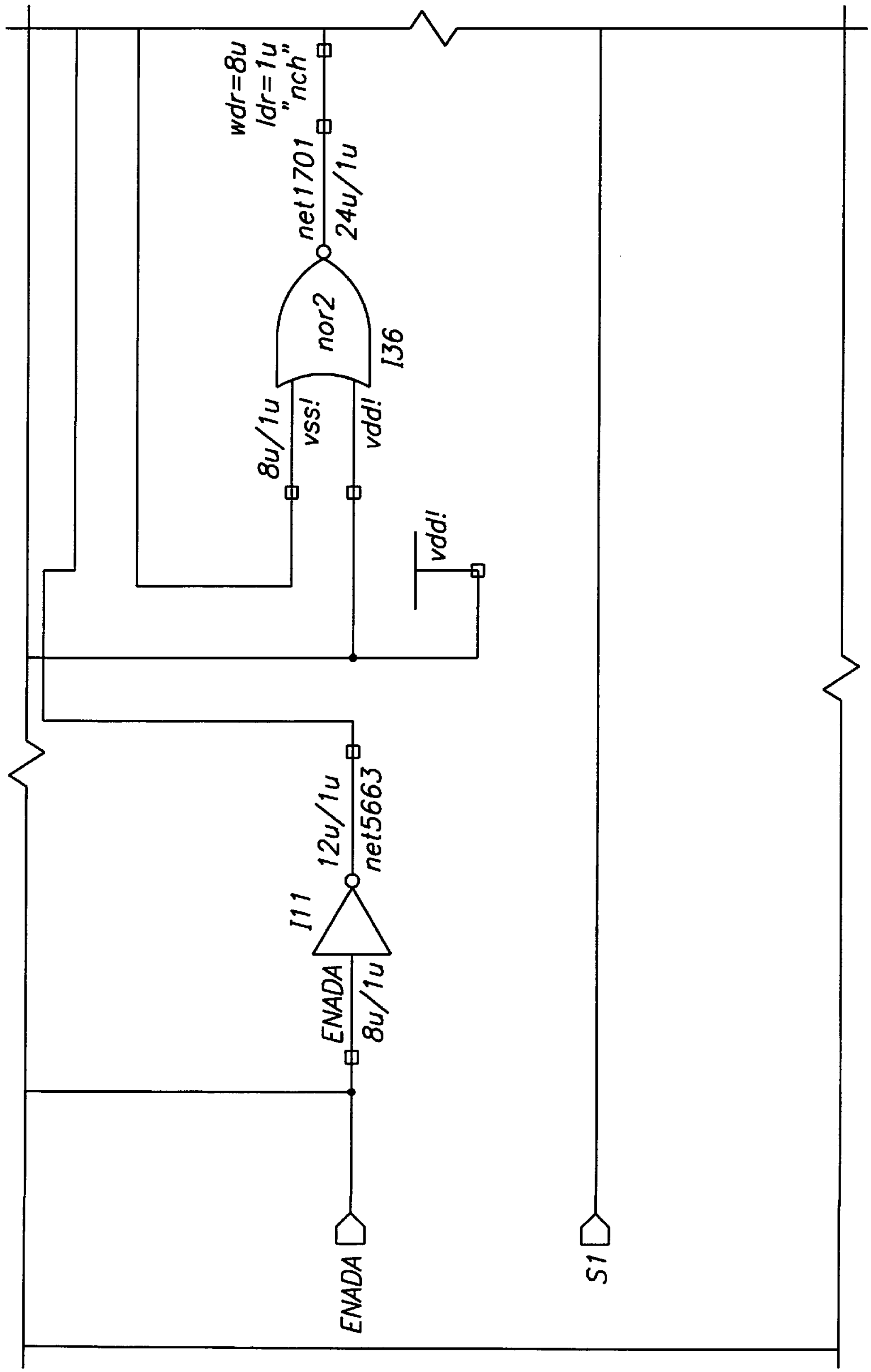
FIG. 9.010301BA

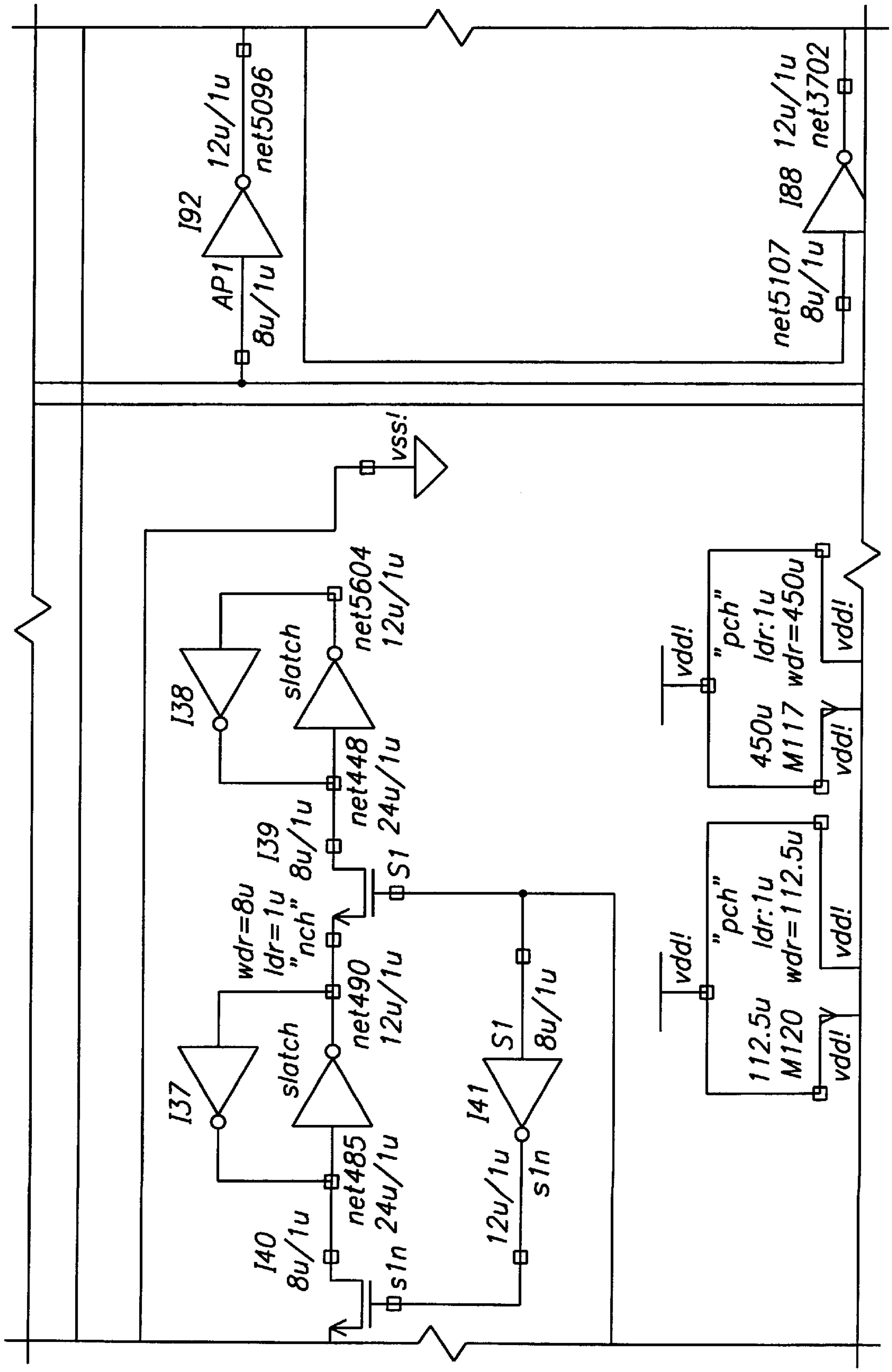
FIG. 9.101.01BB

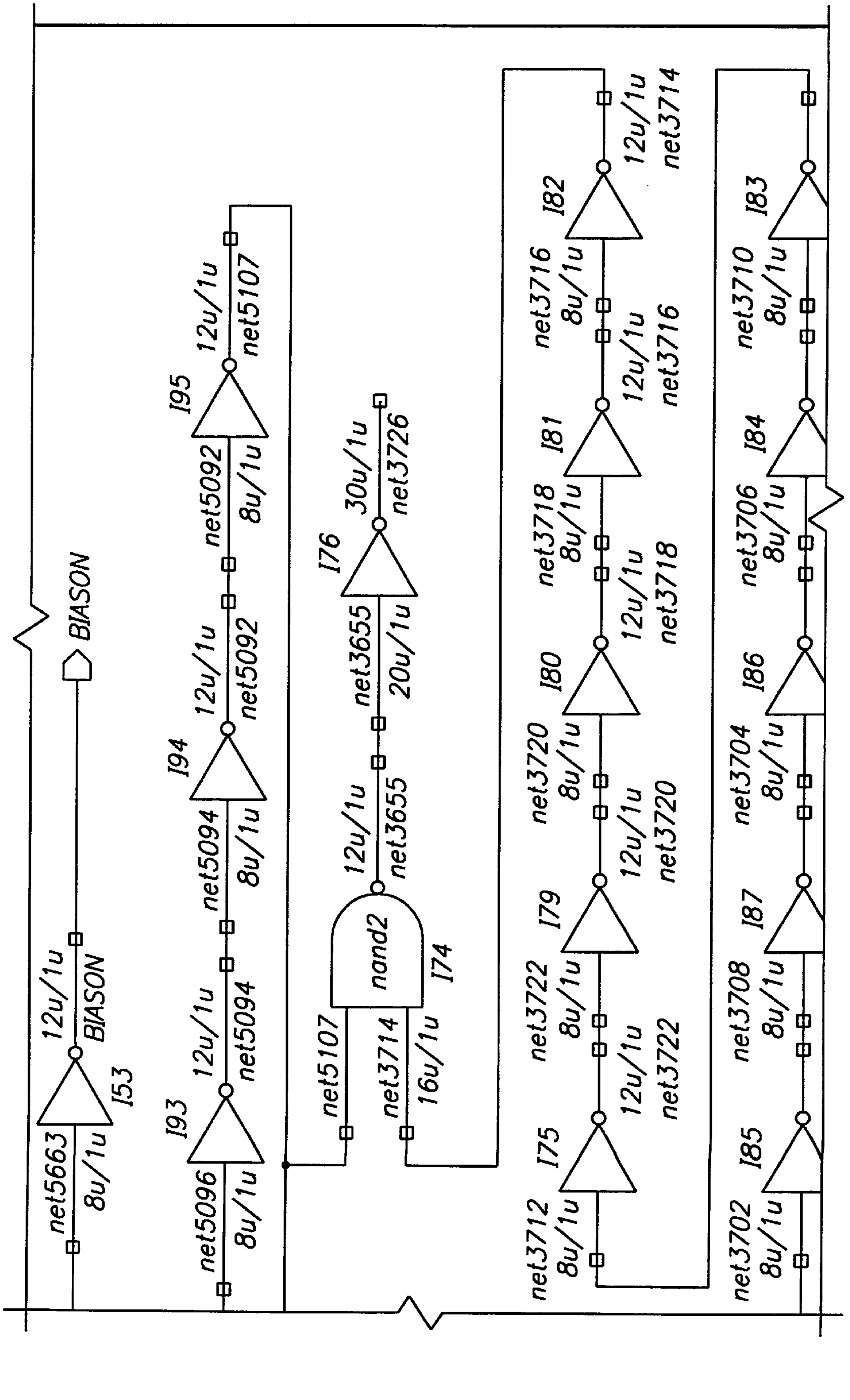
FIG. 9.10.10BE

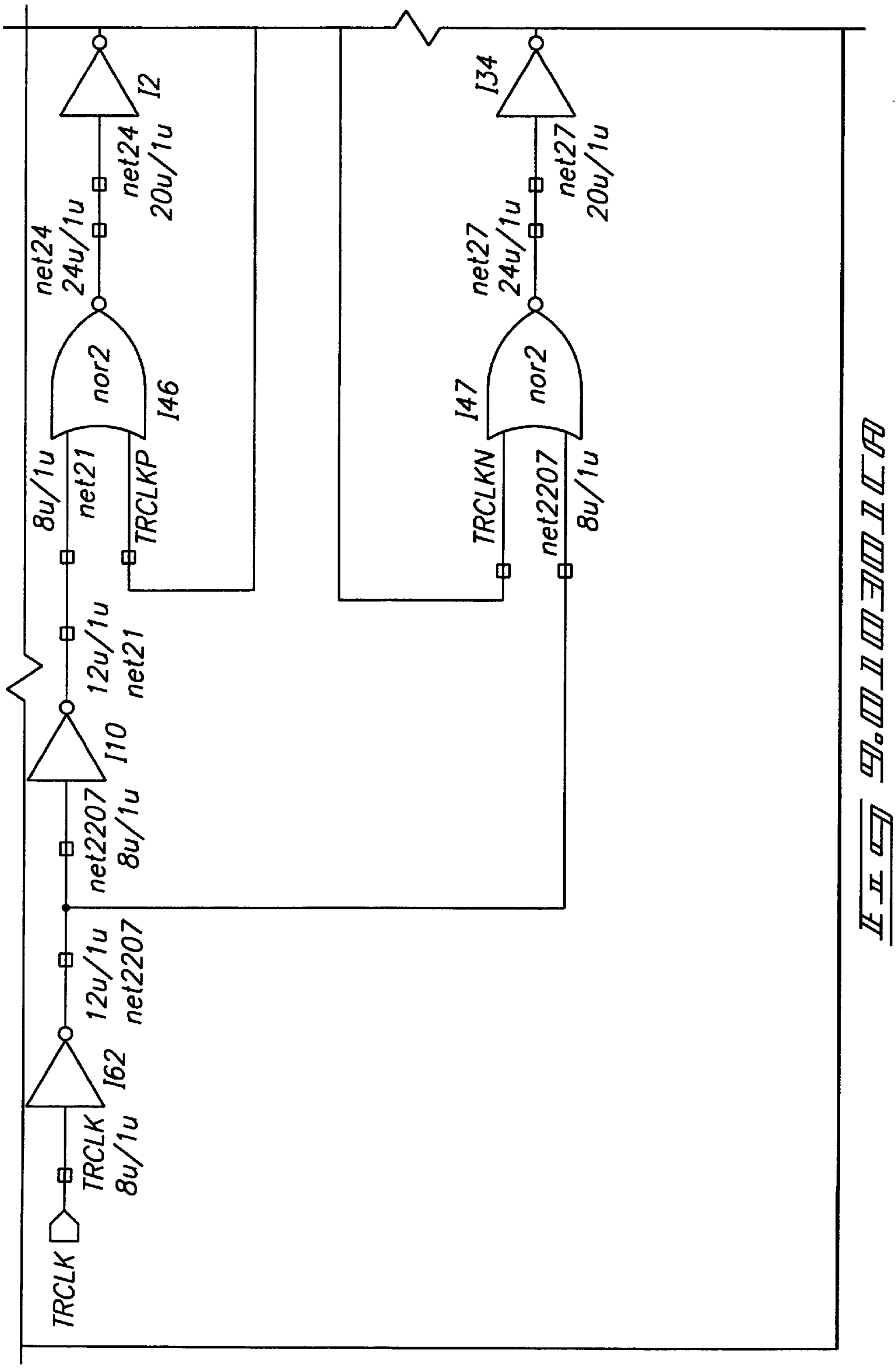
FIG 9.010301CA

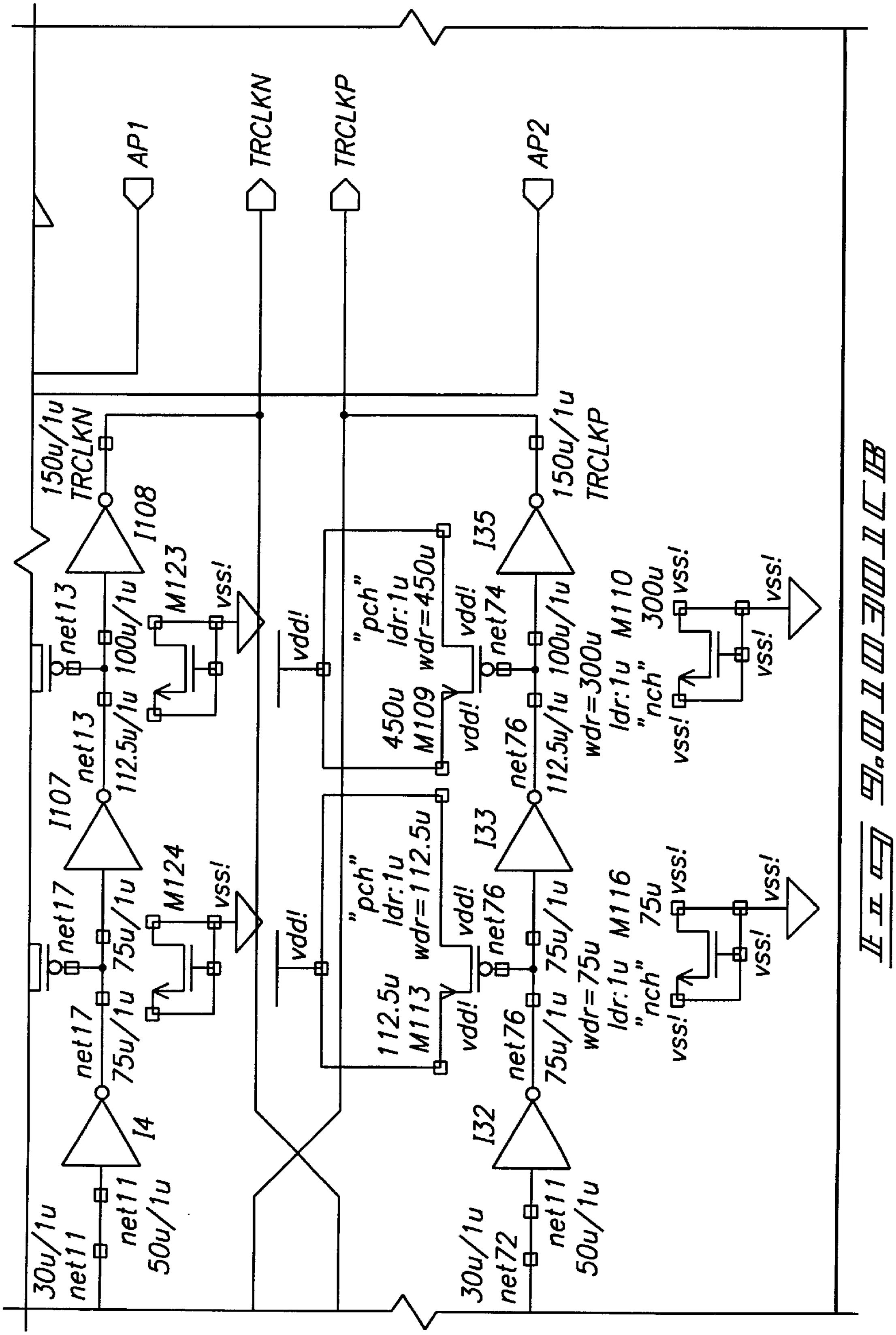
FIG. 9.010301CB

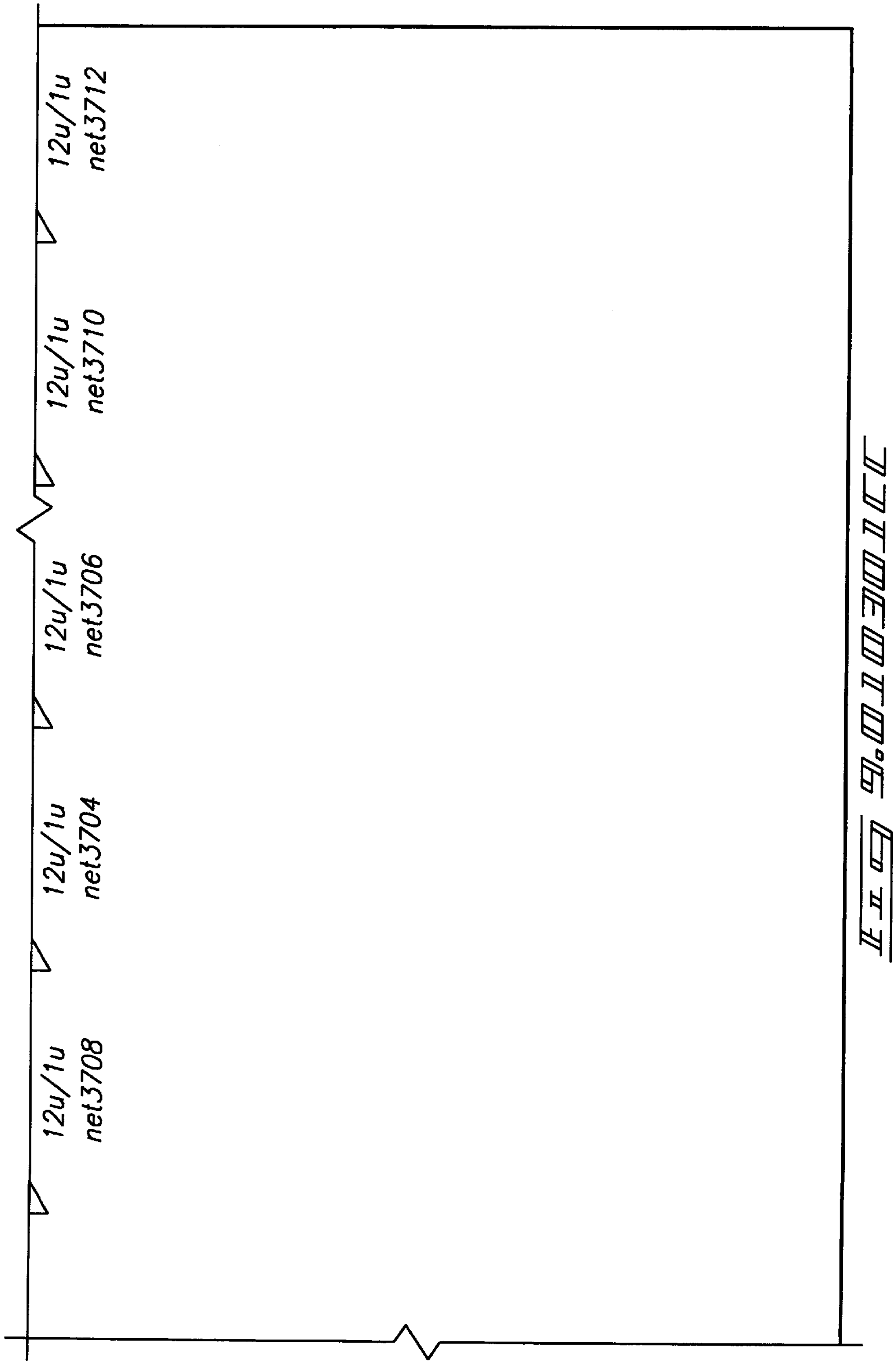
FIG. 9.010301CC

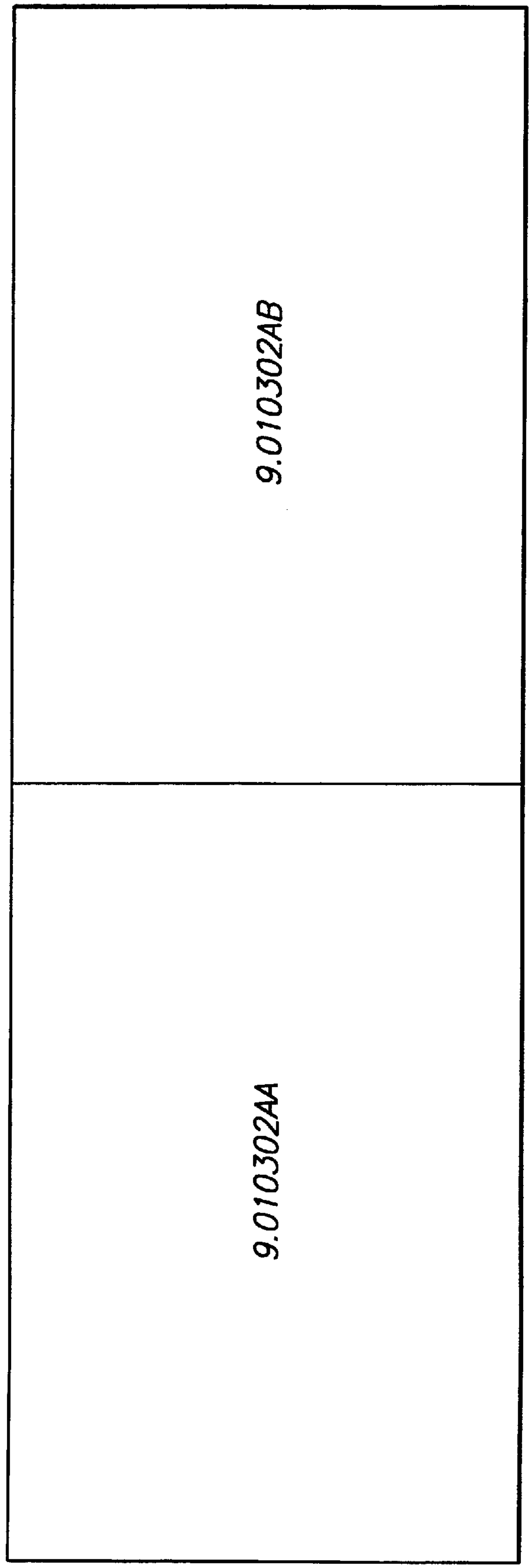
FIG. 9.010302

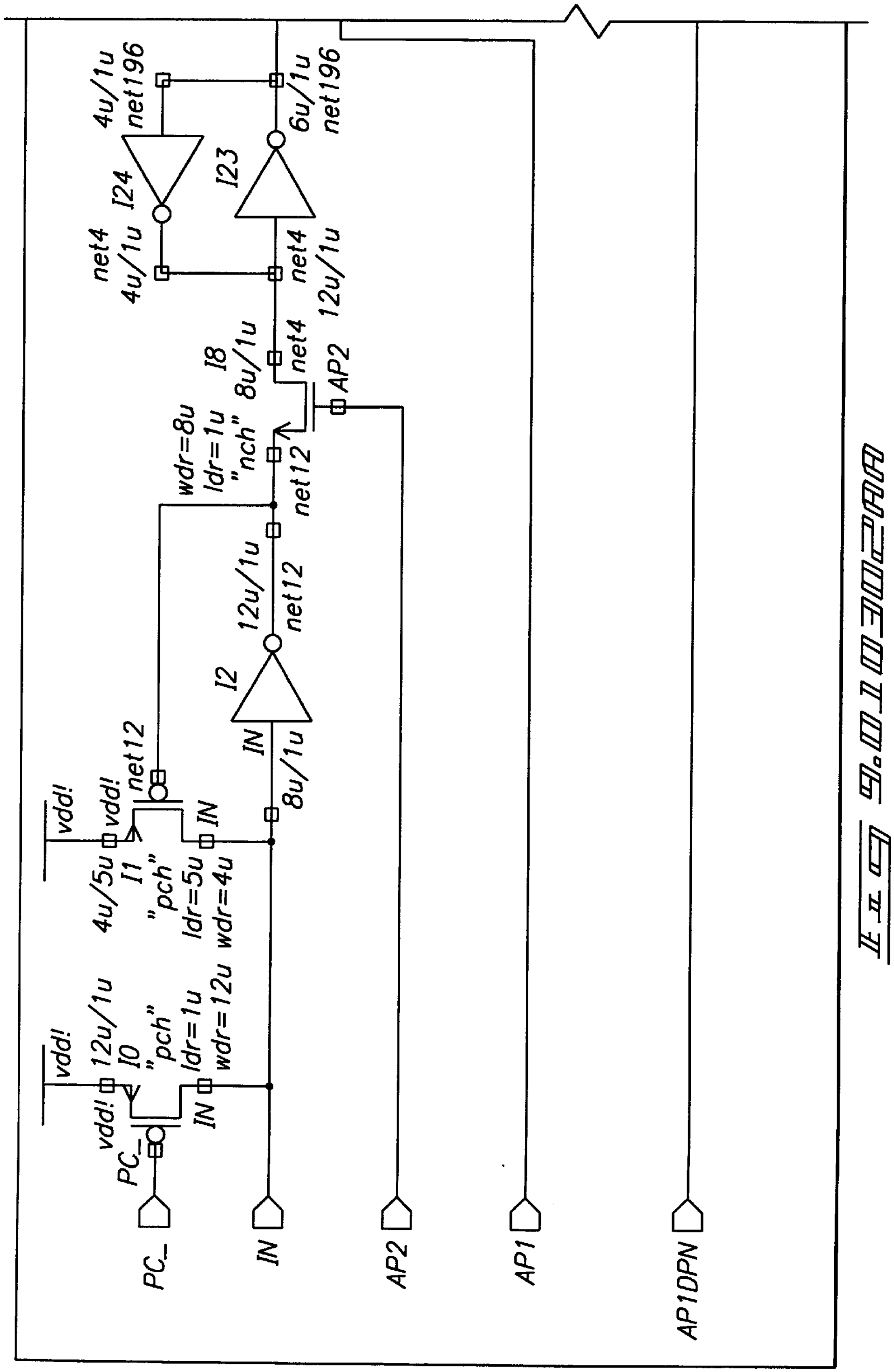
Fig. 9.010302AA

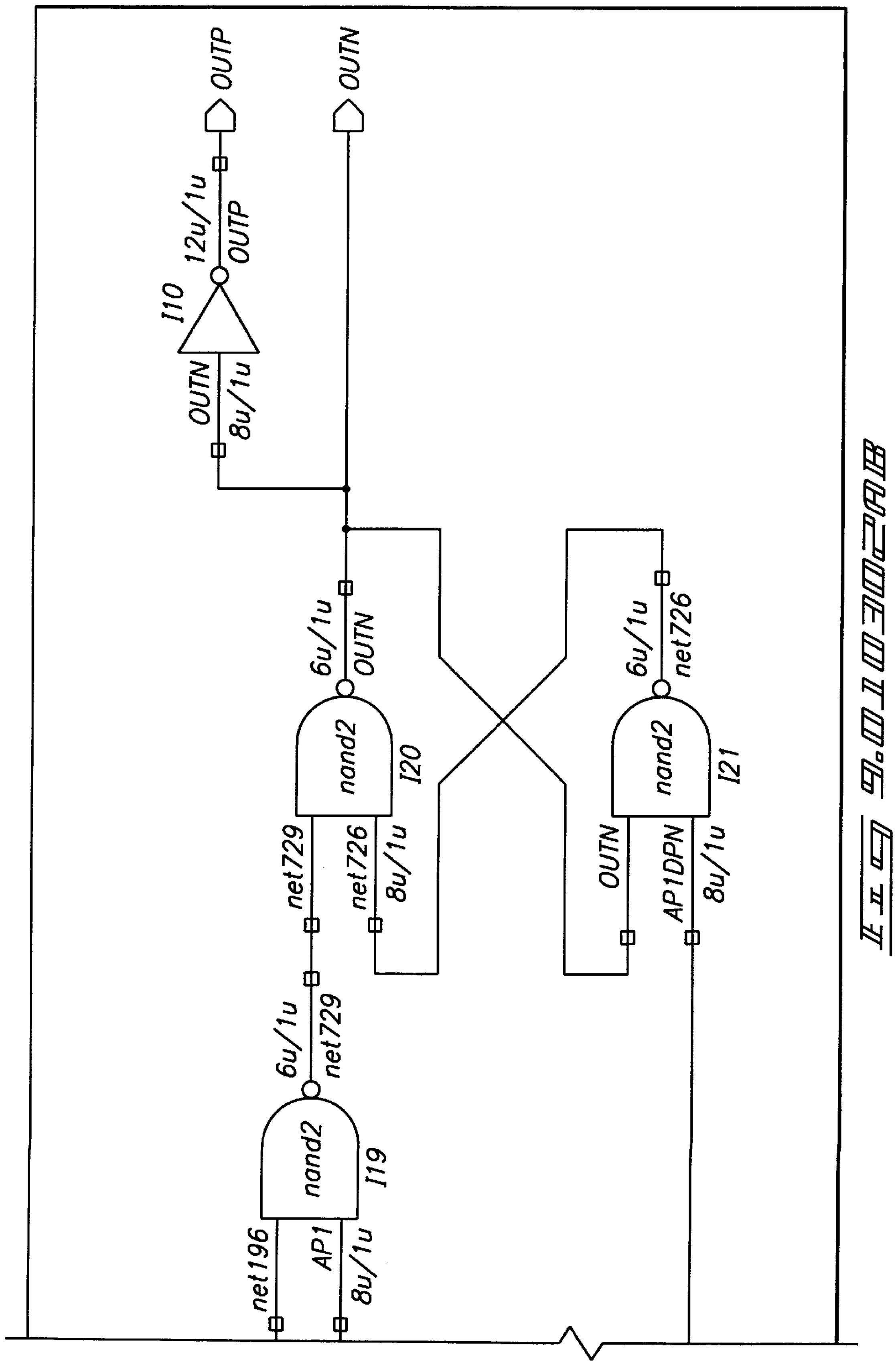
FIG. 9.010302AB

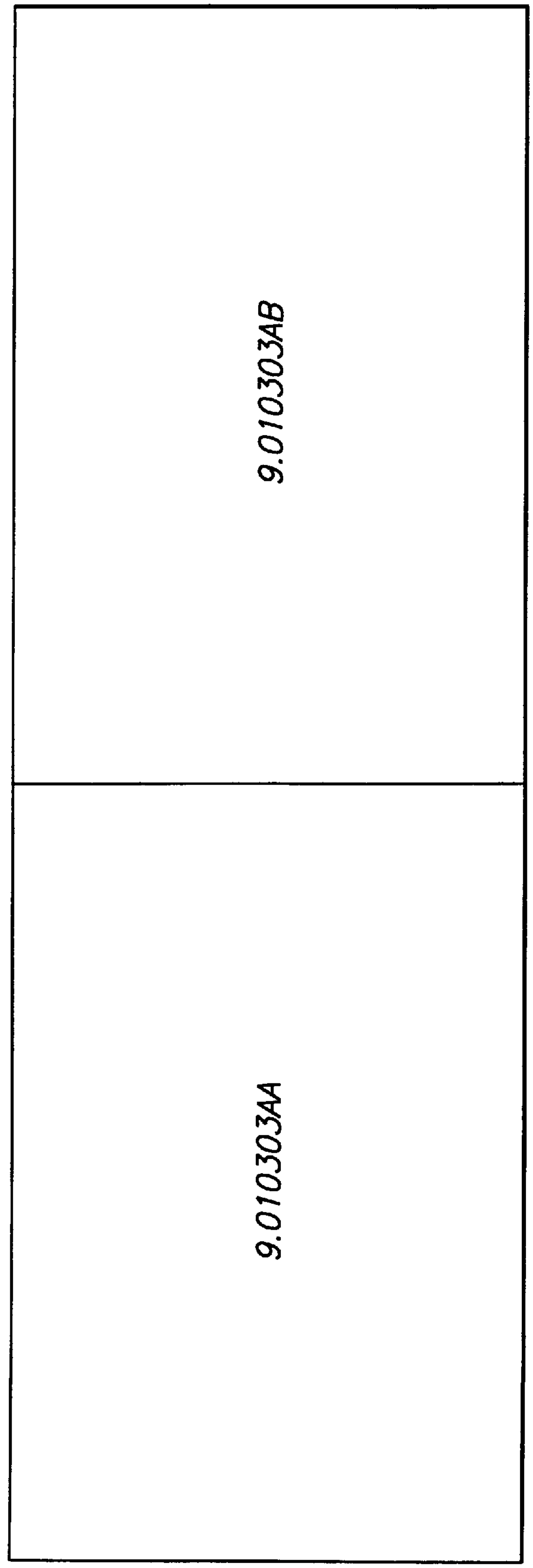
FIG. 9.010303

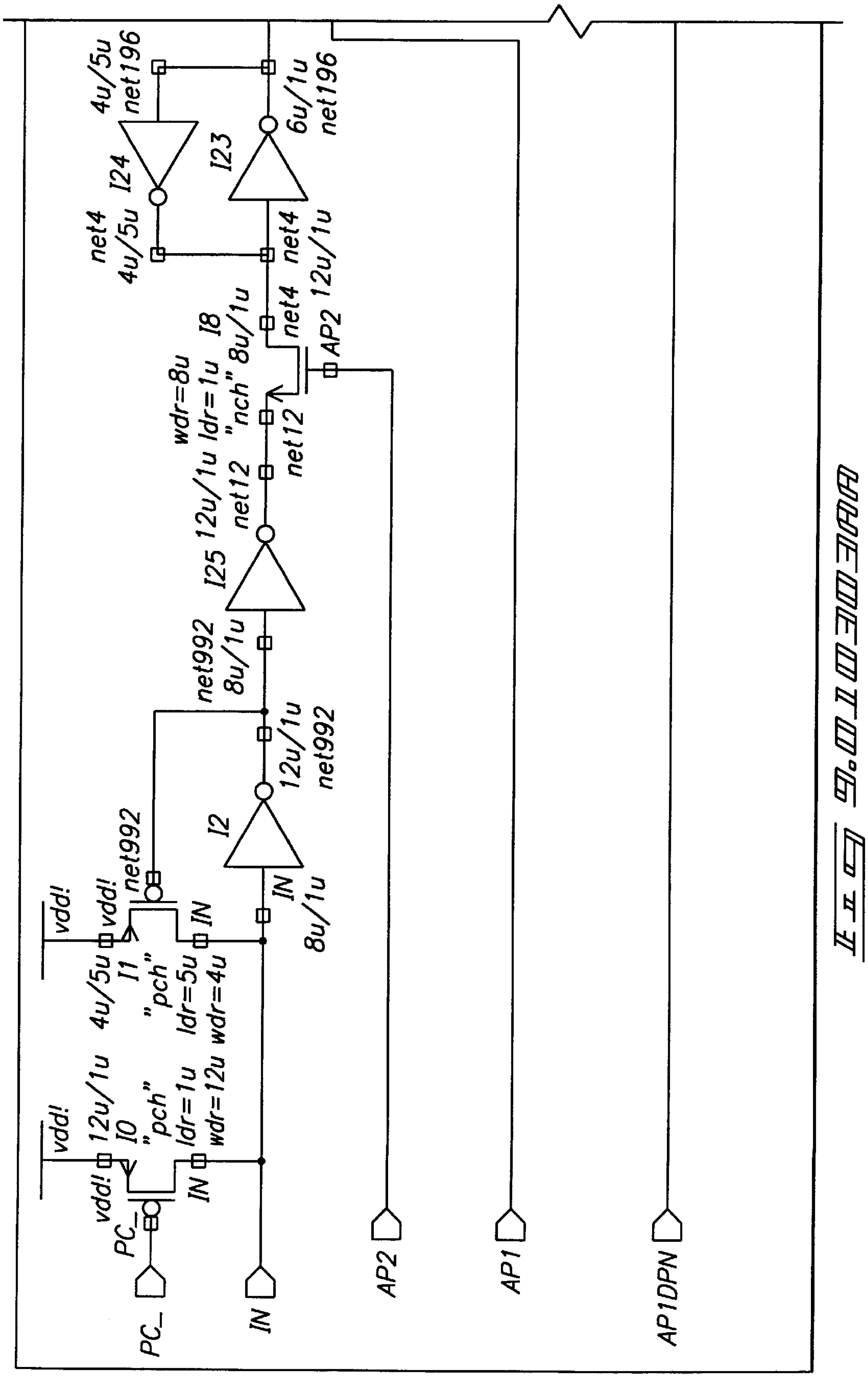
PC_
IN
AP2
AP1
AP1DPN
vdd!
I0
"pch"
ldr=1u
wdr=12u
12u/1u
I1
"pch"
ldr=5u
wdr=4u
4u/5u
net992
I2
8u/1u
12u/1u
I25
net12
I8
"nch"
wdr=8u
ldr=1u
8u/1u
net4
12u/1u
I23
6u/1u
net196
I24
4u/5u

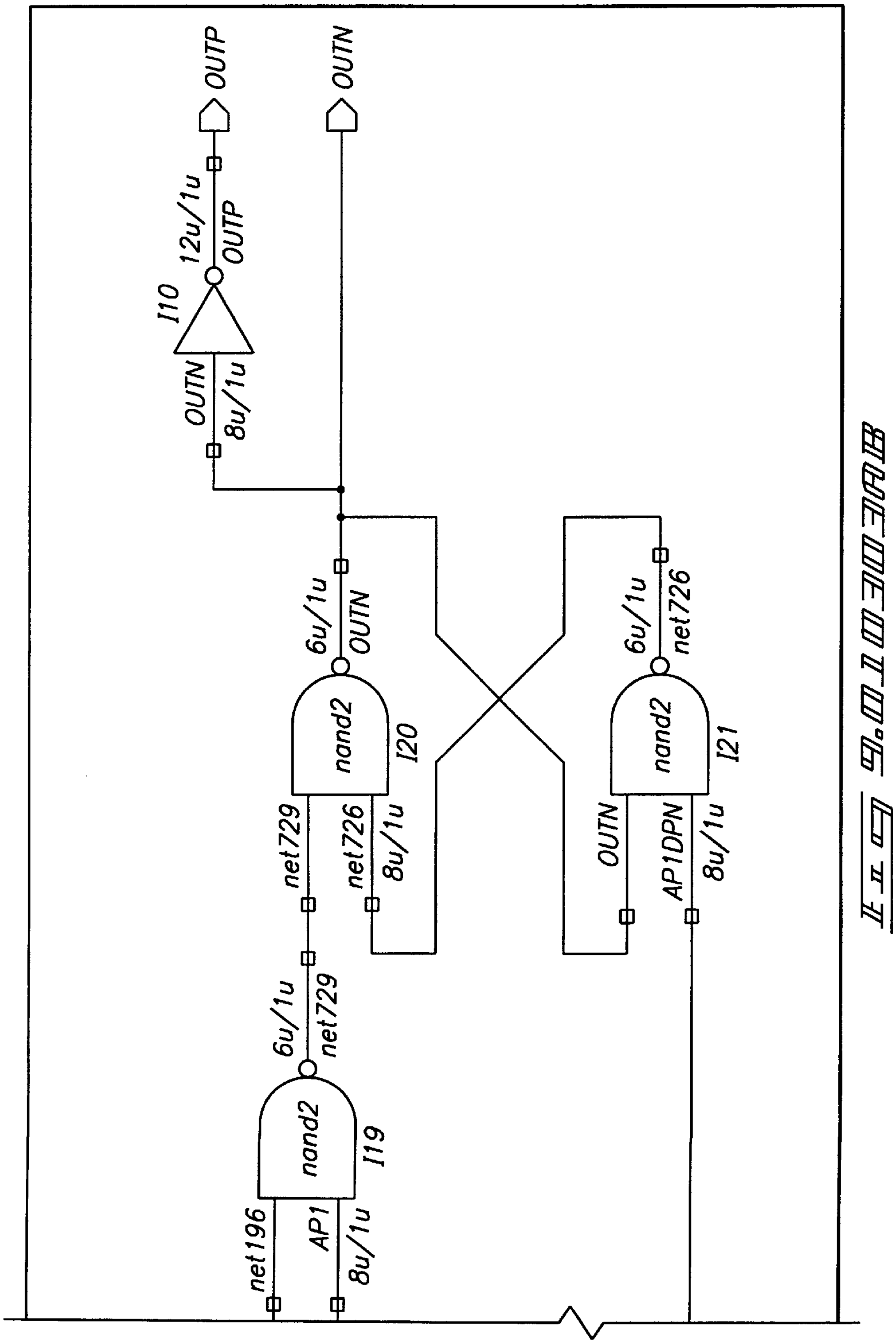
FIG. 9.010303AB

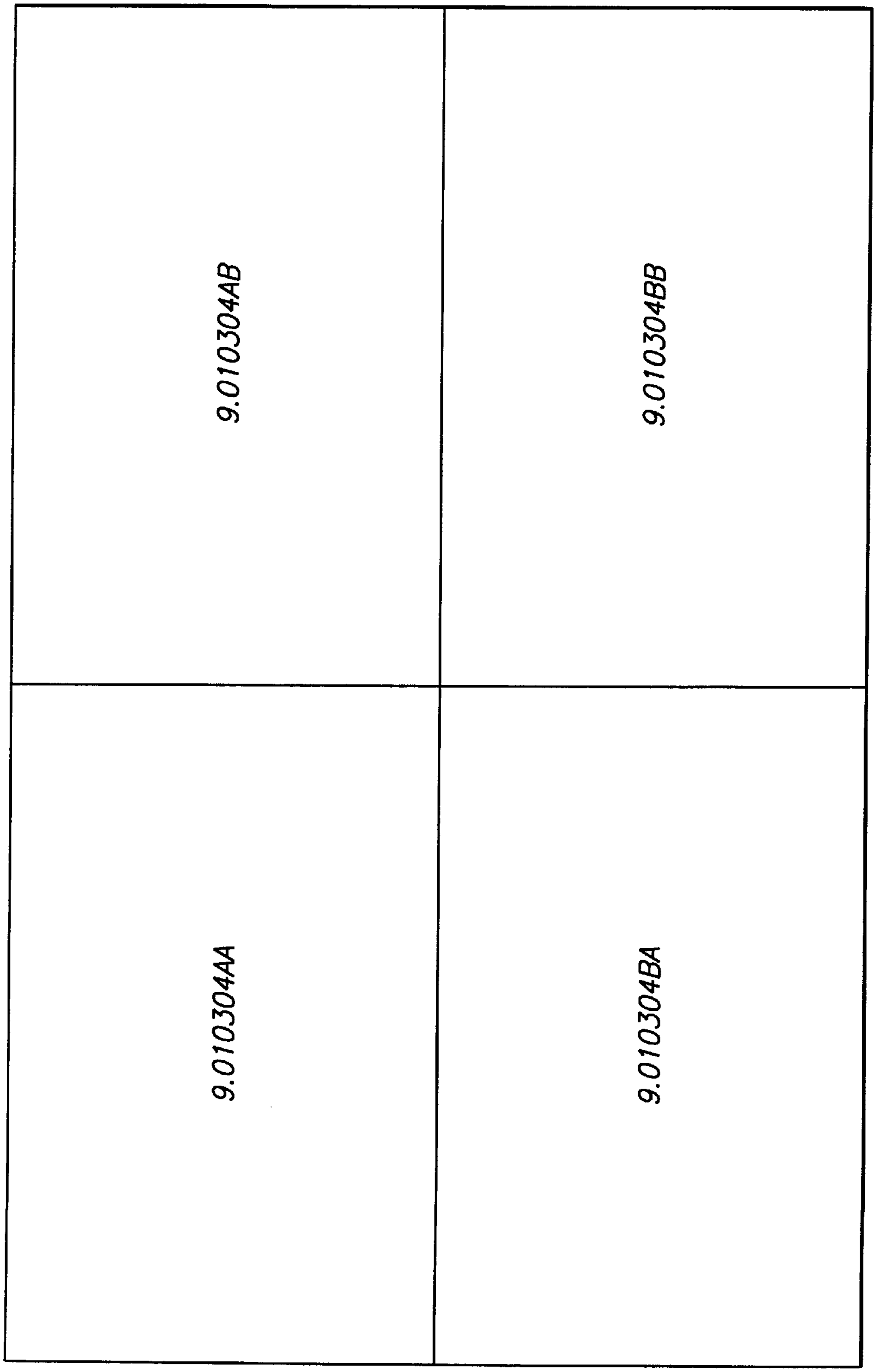
FIG. 9.010304

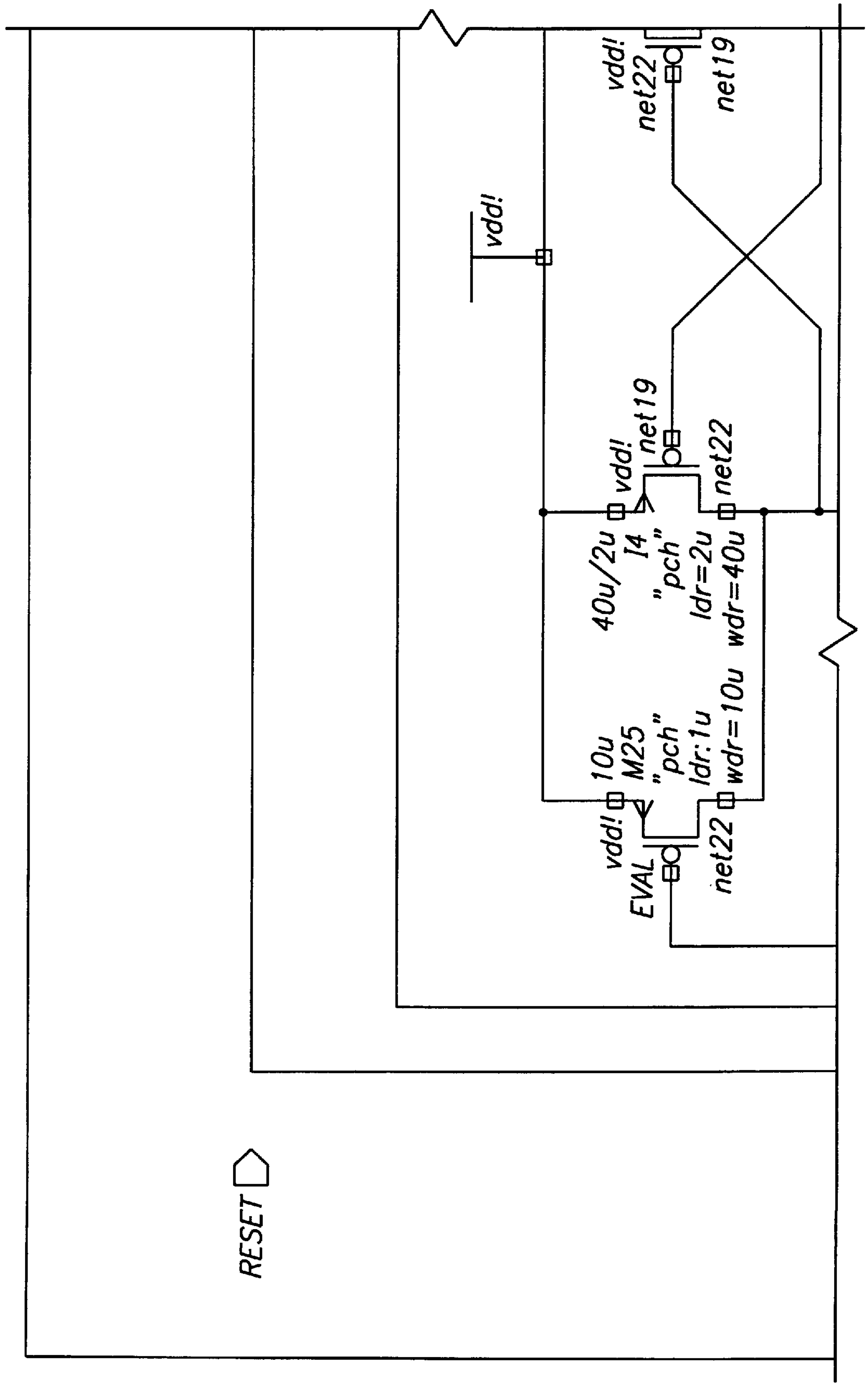
Fig. 9.010E0.7AA

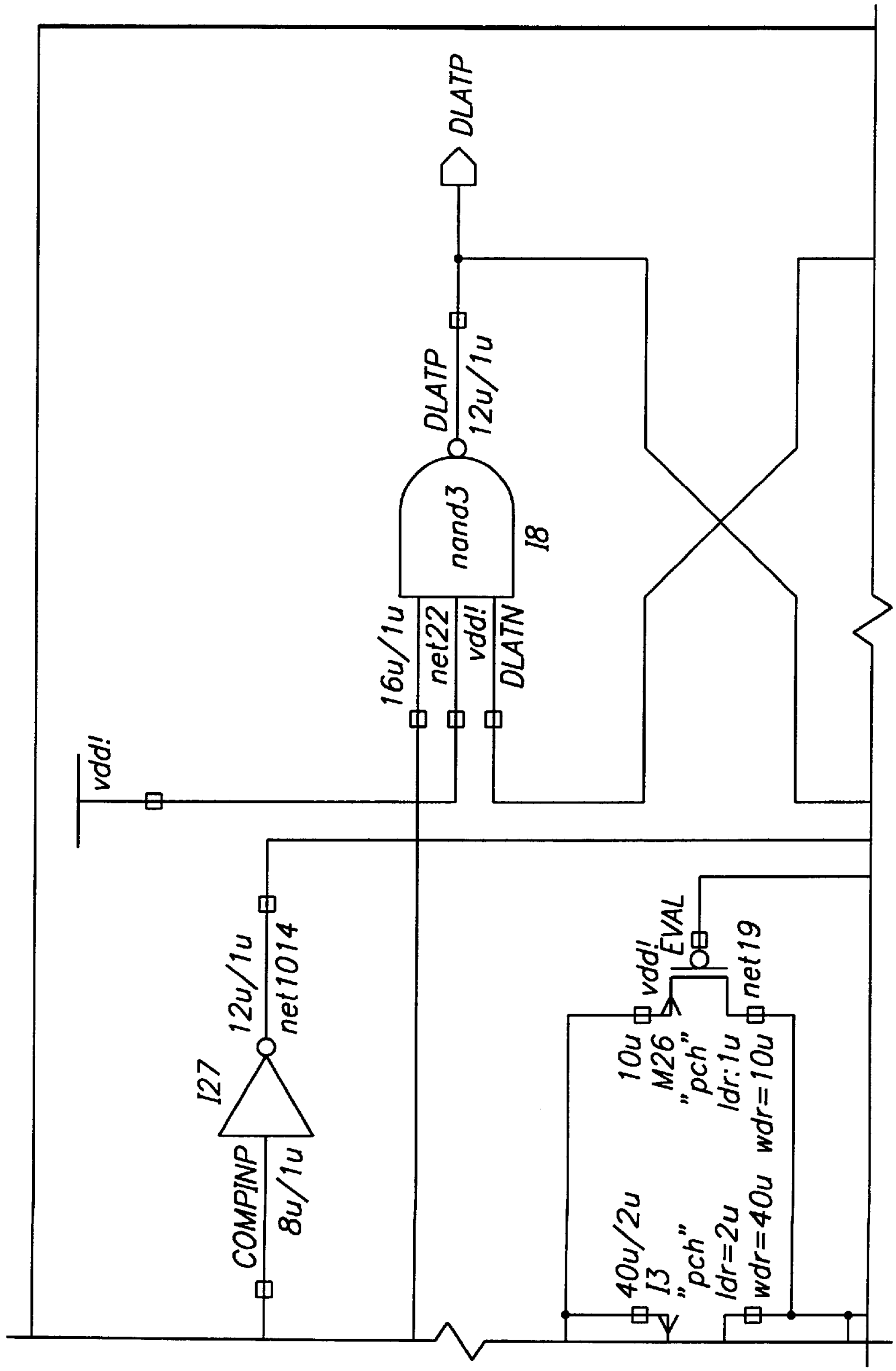
Fig. 9.010304AB

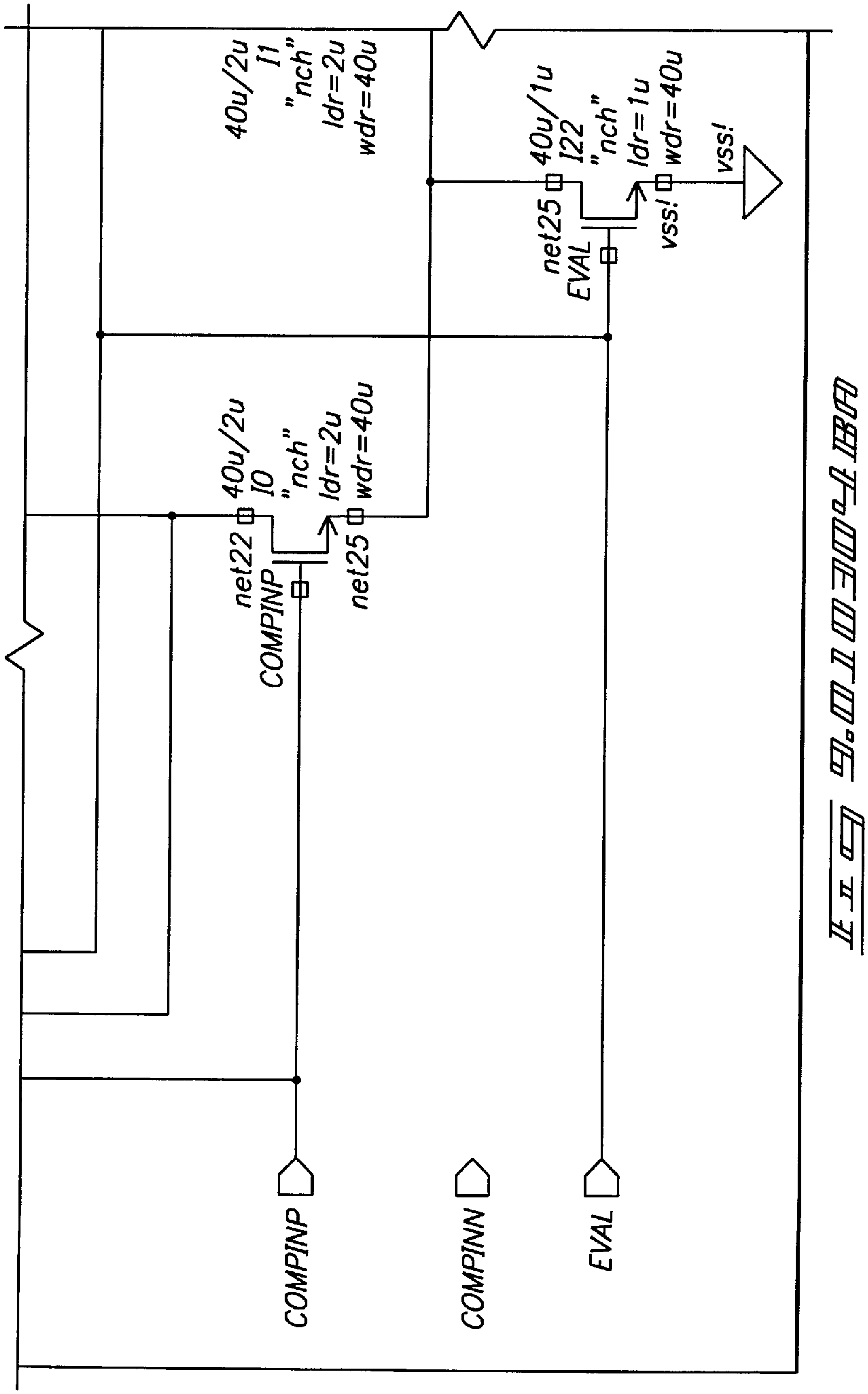
FIG. 9.010304.BA

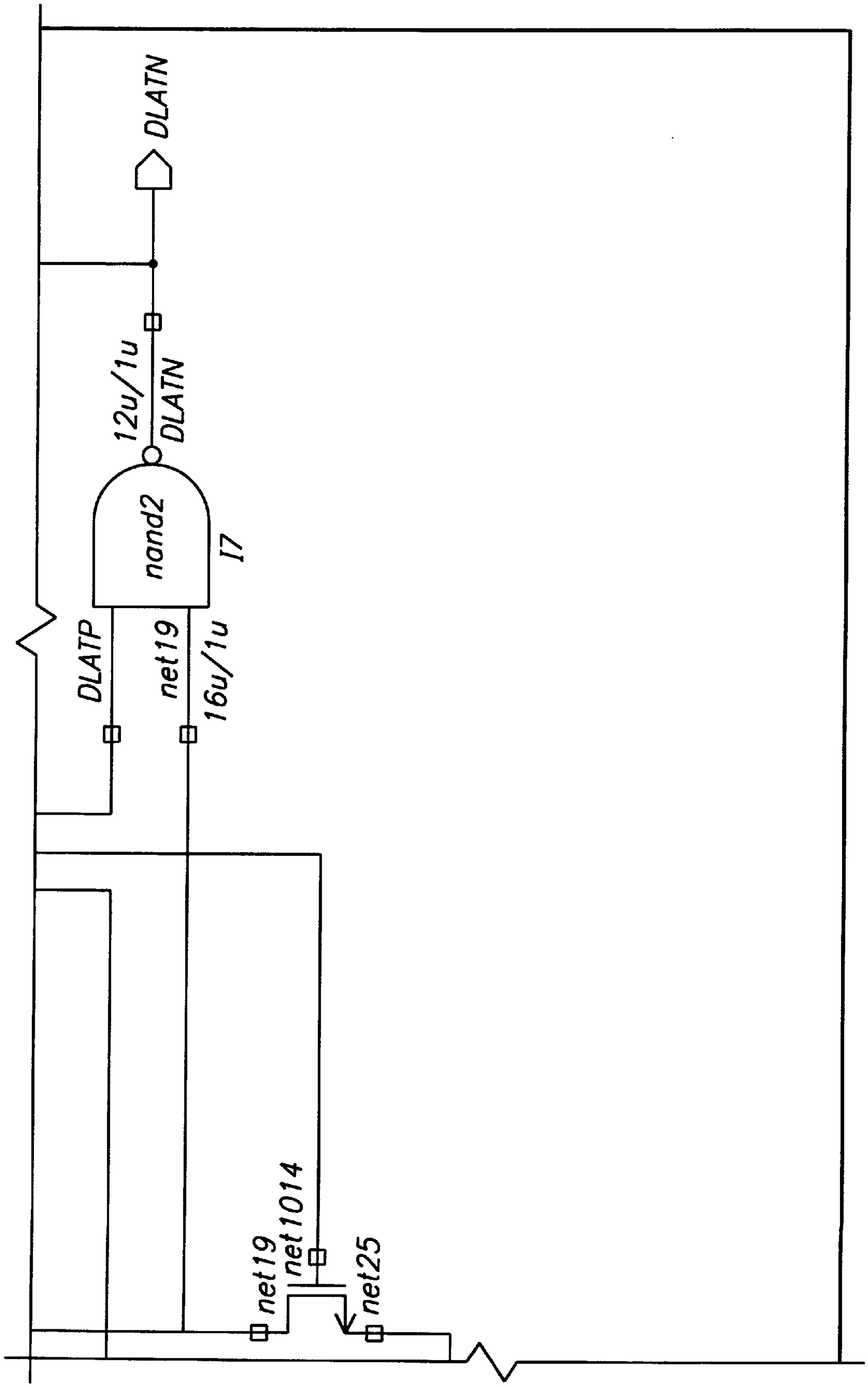
DLATN
12u/1u
DLATN
nand2
I7
DLATP
net19
16u/1u
net1014
net19
net25

| | | | | |
|---|---|---|---|---|
| 9.0104AA | 9.0104AB | 9.0104AC | 9.0104AD | 9.0104AE |
| 9.0104BA | 9.0104BB | 9.0104BC | 9.0104BD | 9.0104BE |
| 9.0104CA | 9.0104CB | 9.0104CC | 9.0104CD | |
| 9.0104DA | 9.0104DB | 9.0104DC | 9.0104DD | |

FIG. 9.0104

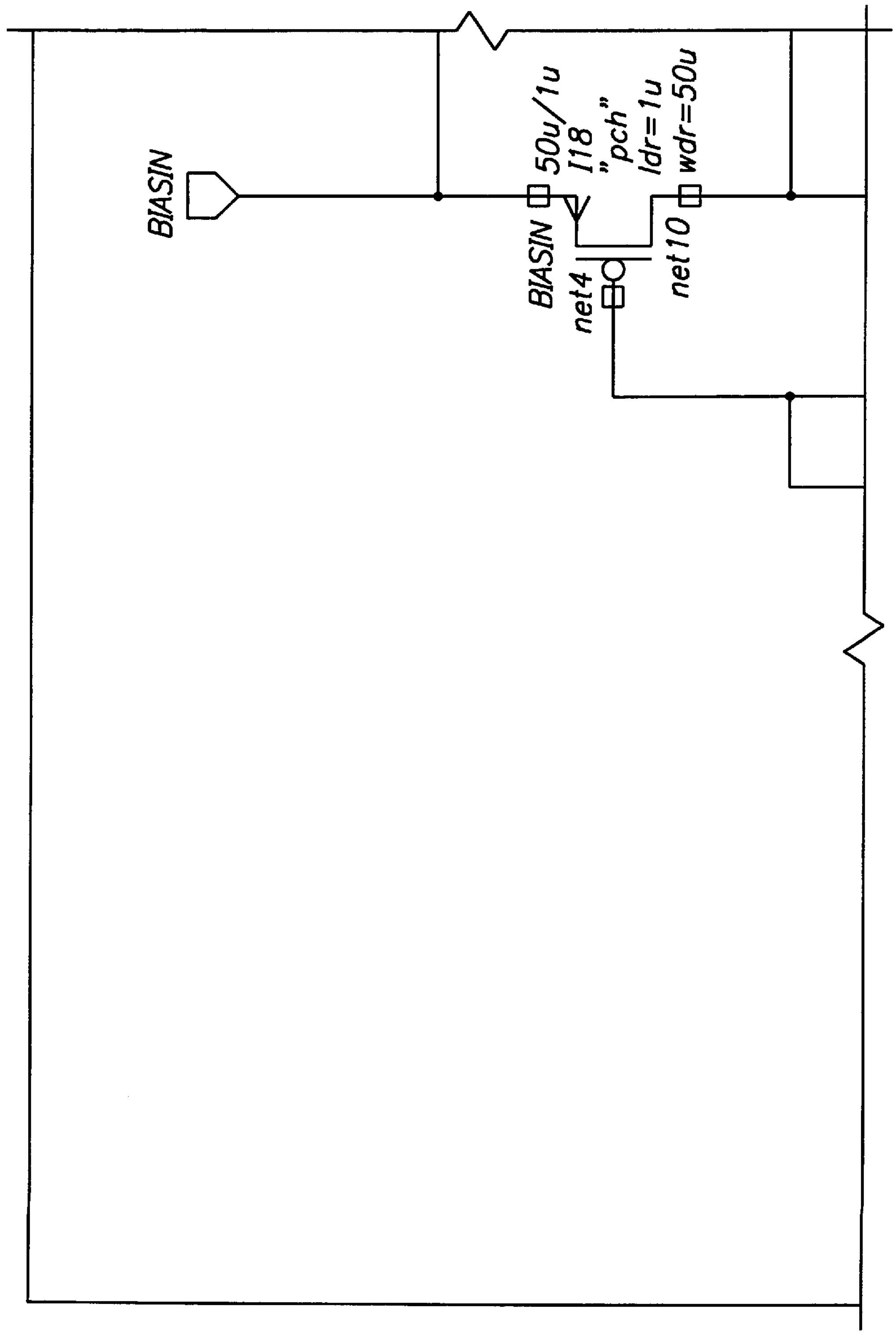
FIG. 9.0104AA

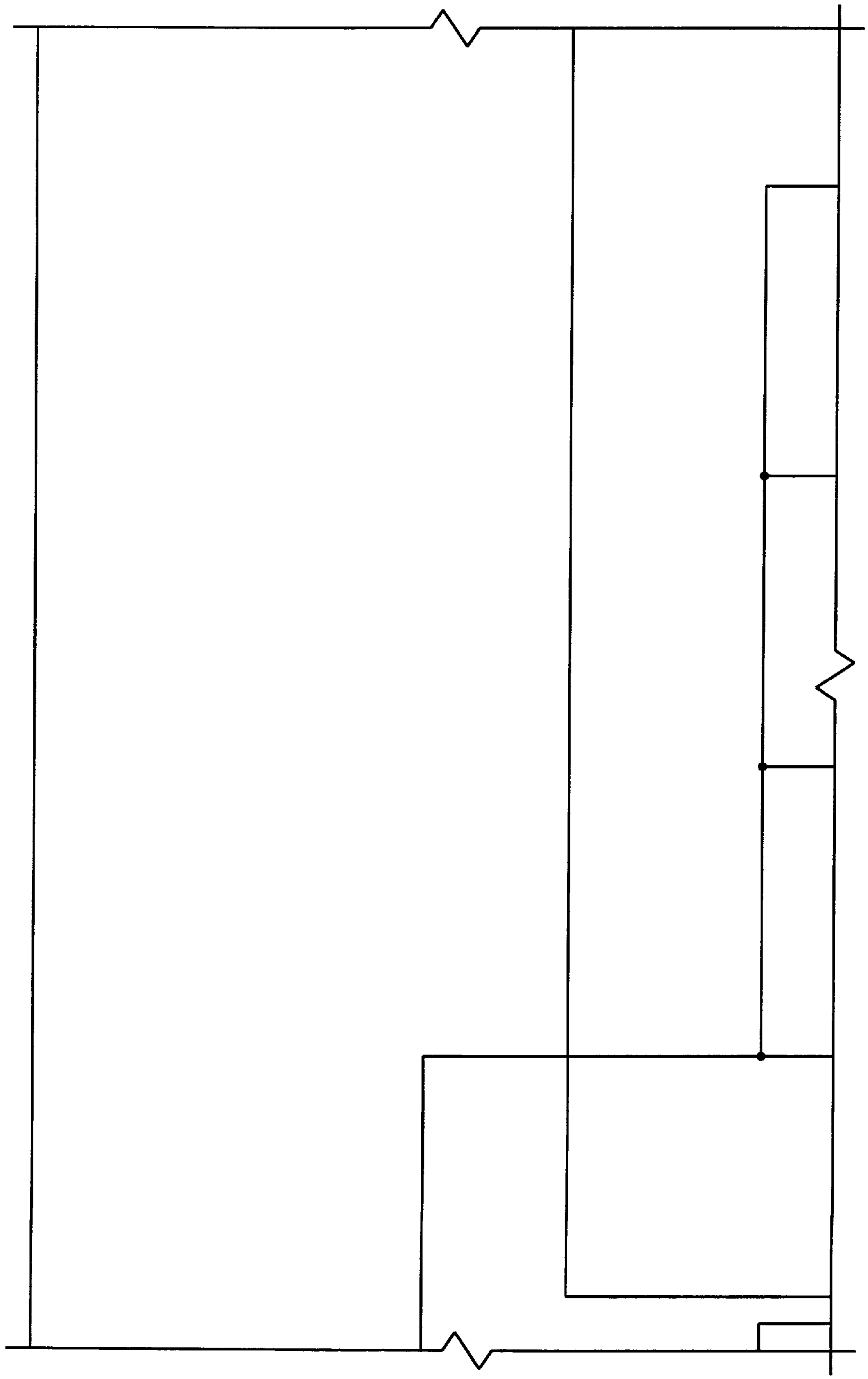
FIG. 9.0104AB

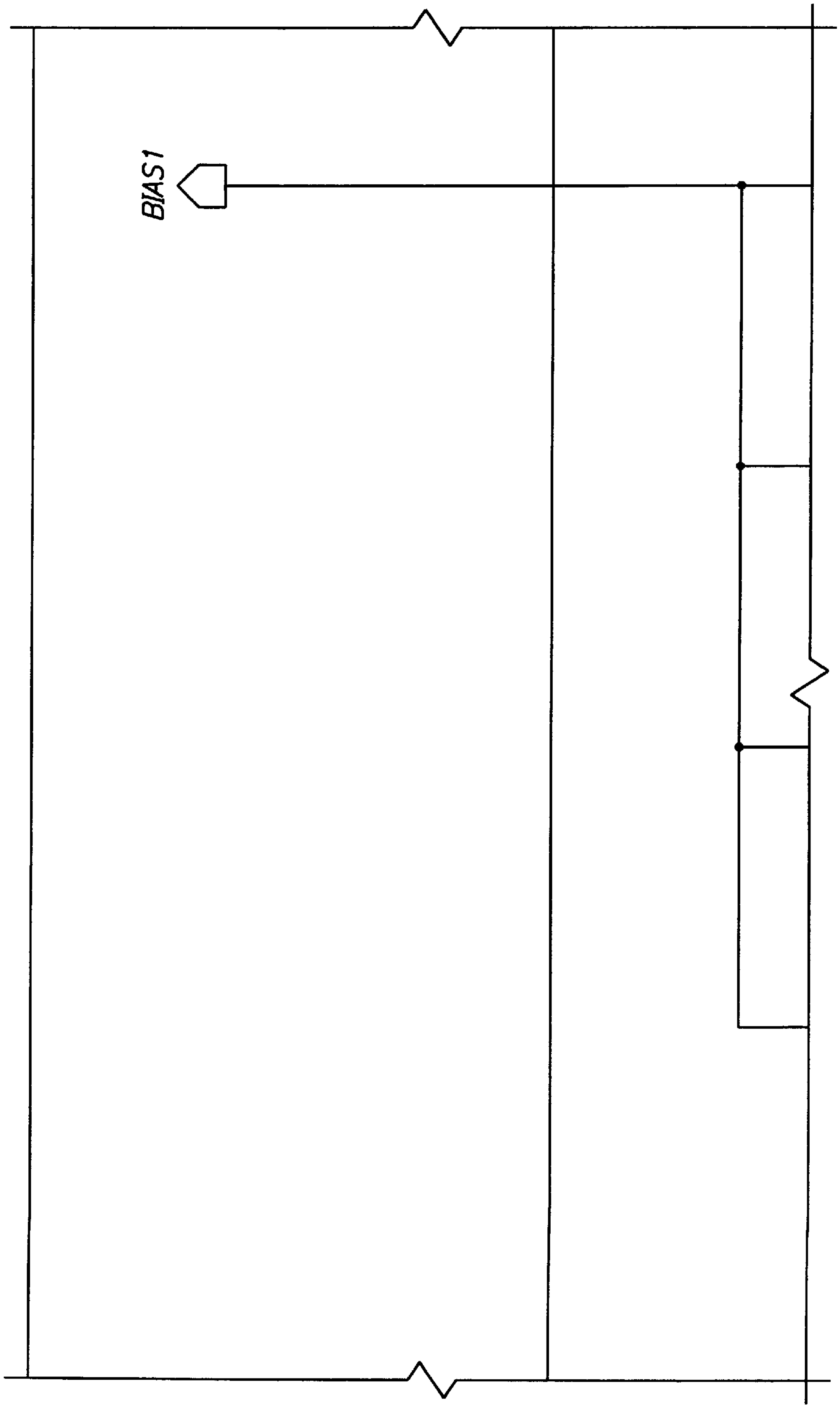
FIG. 9.0104AC

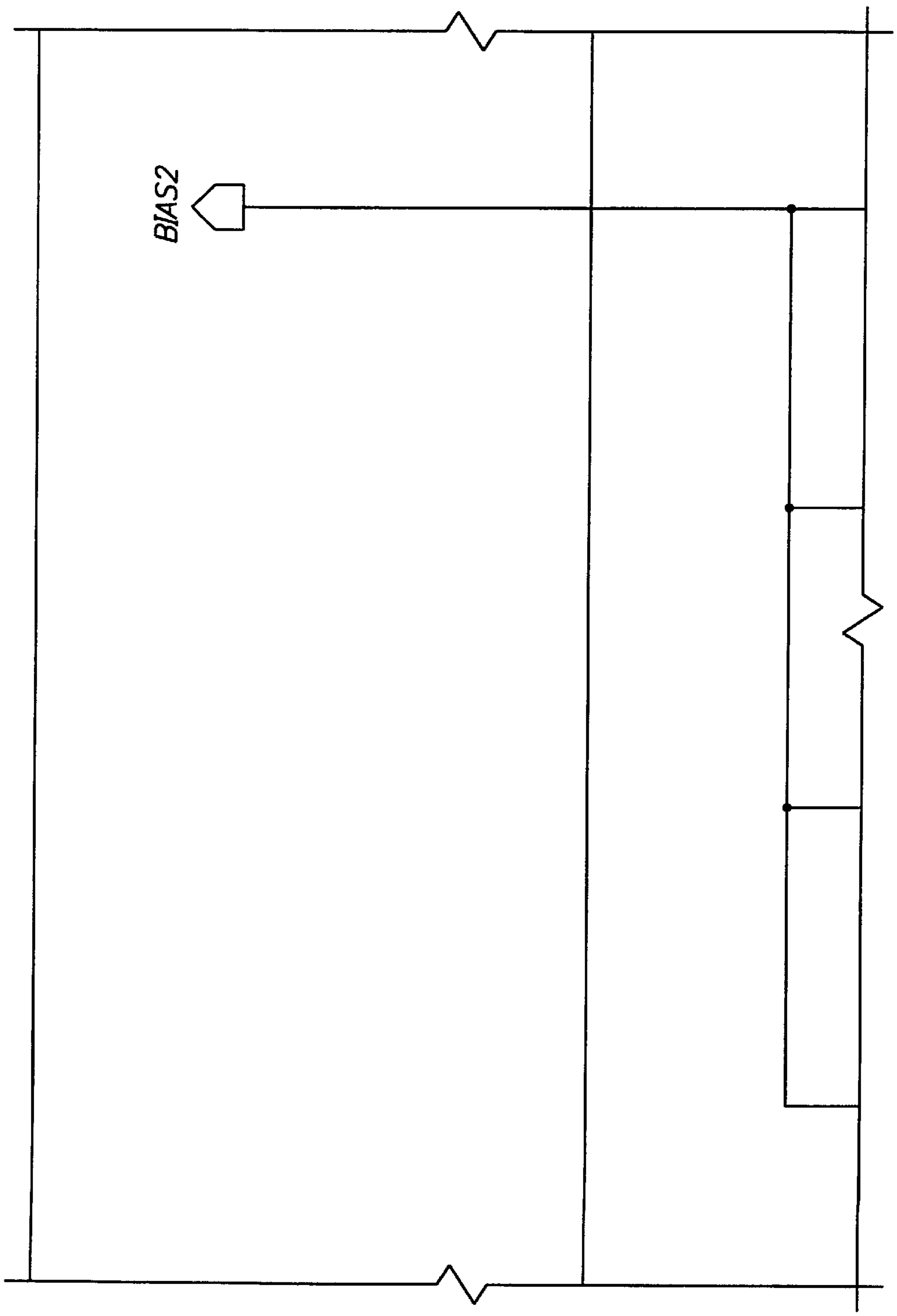
Fig. 9.0104AD

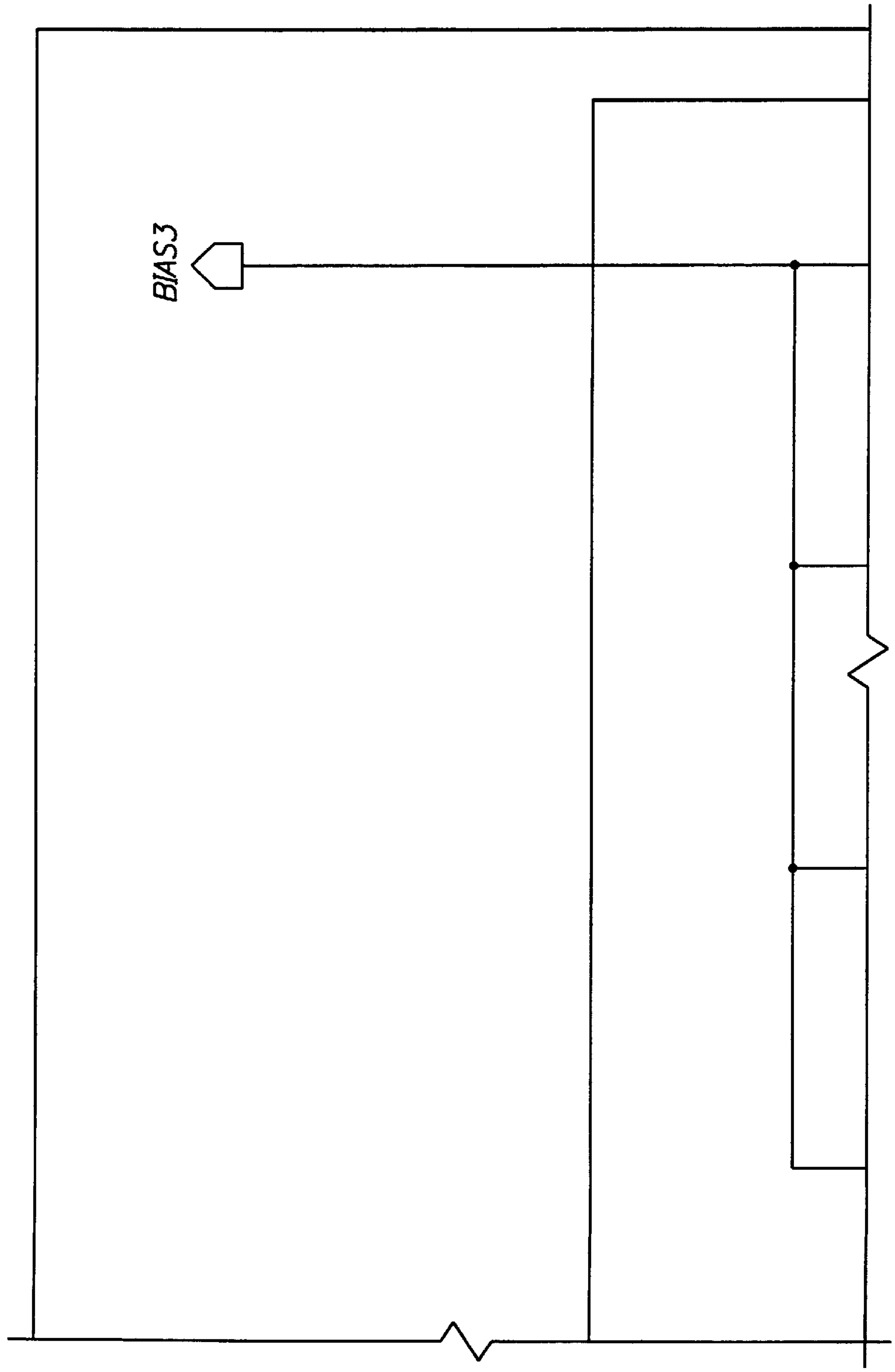
FIG. 9.010.4AE

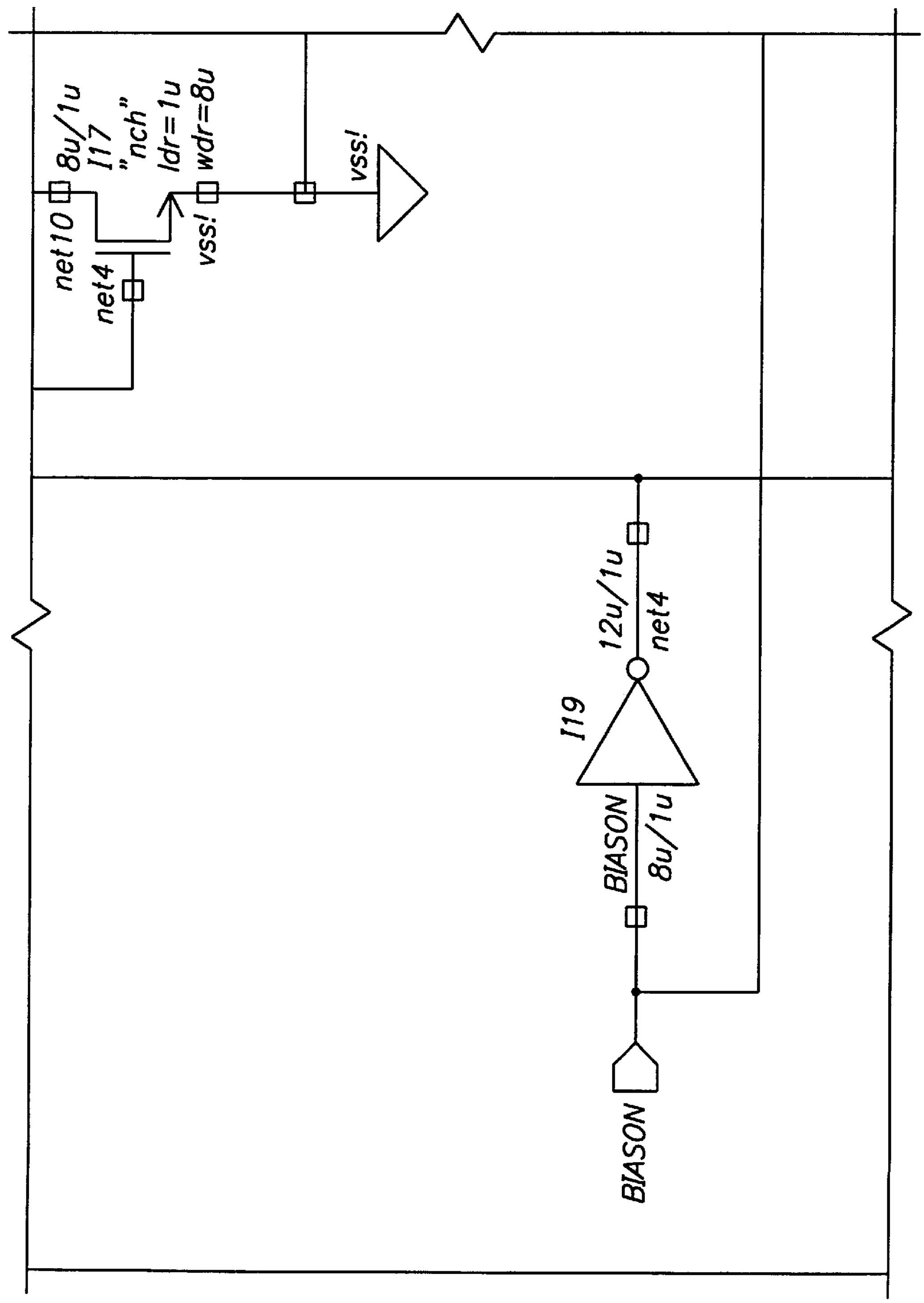
Fig. 9.0104BA

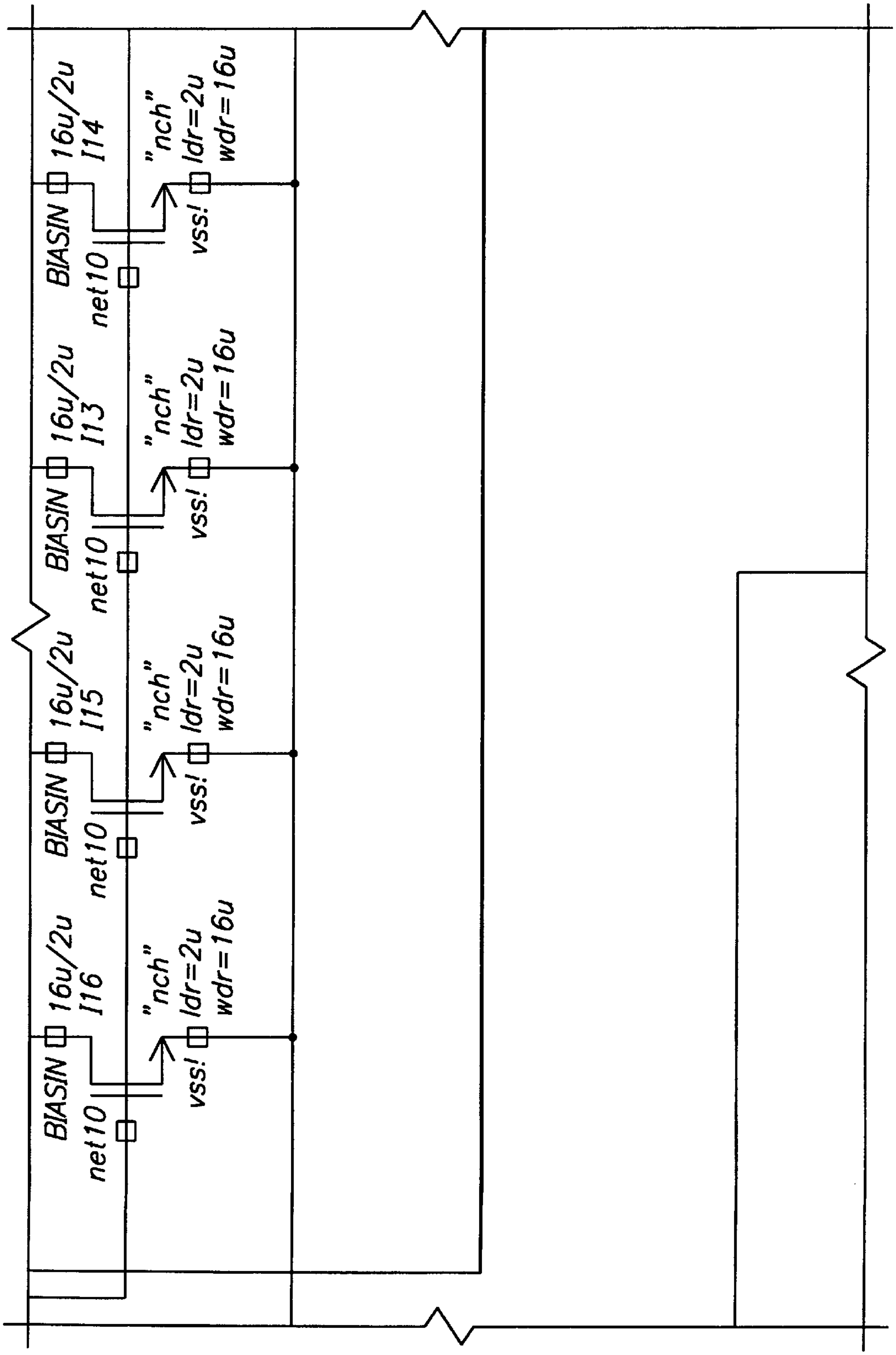
FIG. 9.0104BB

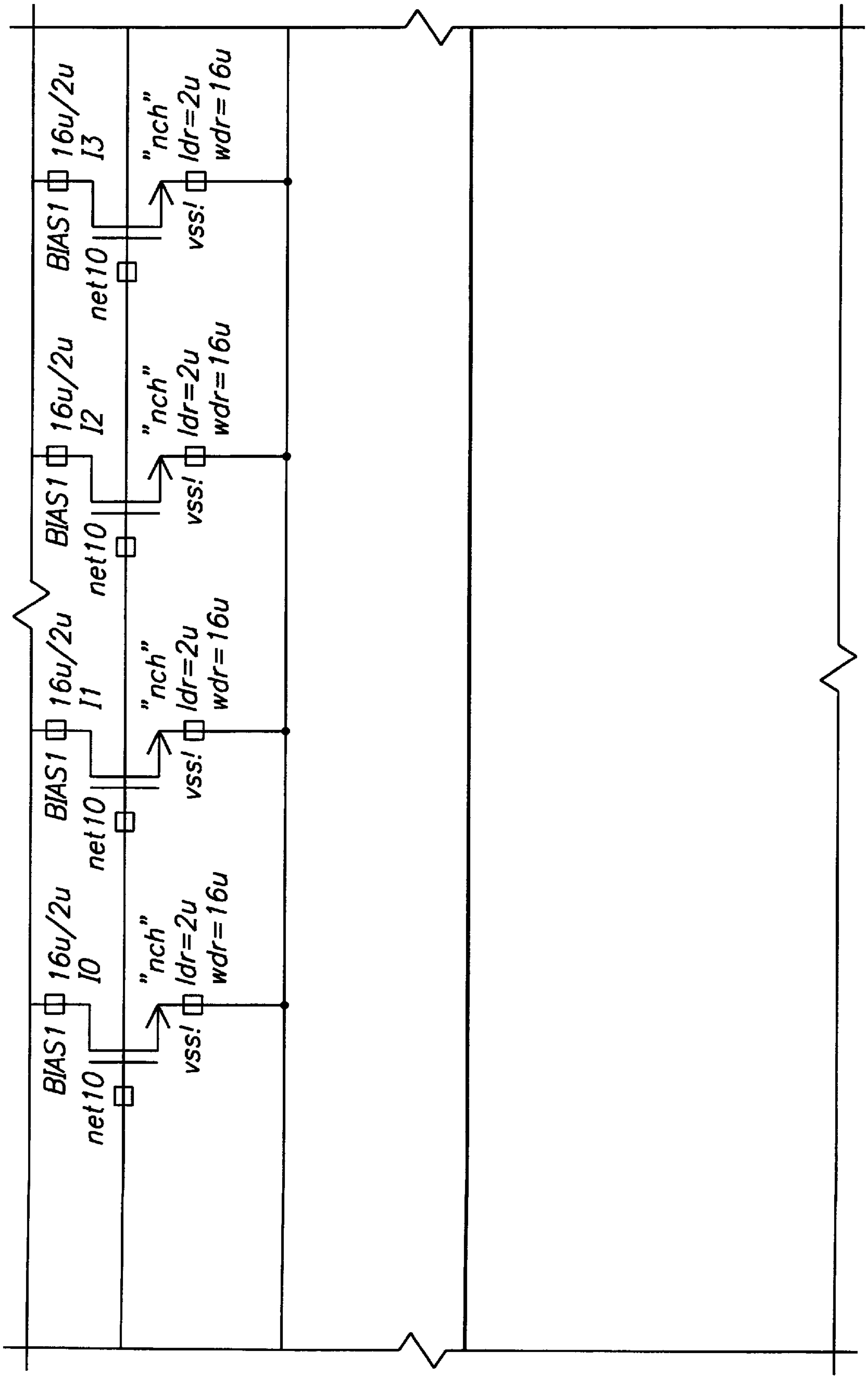
FIG. 9.010.4BC

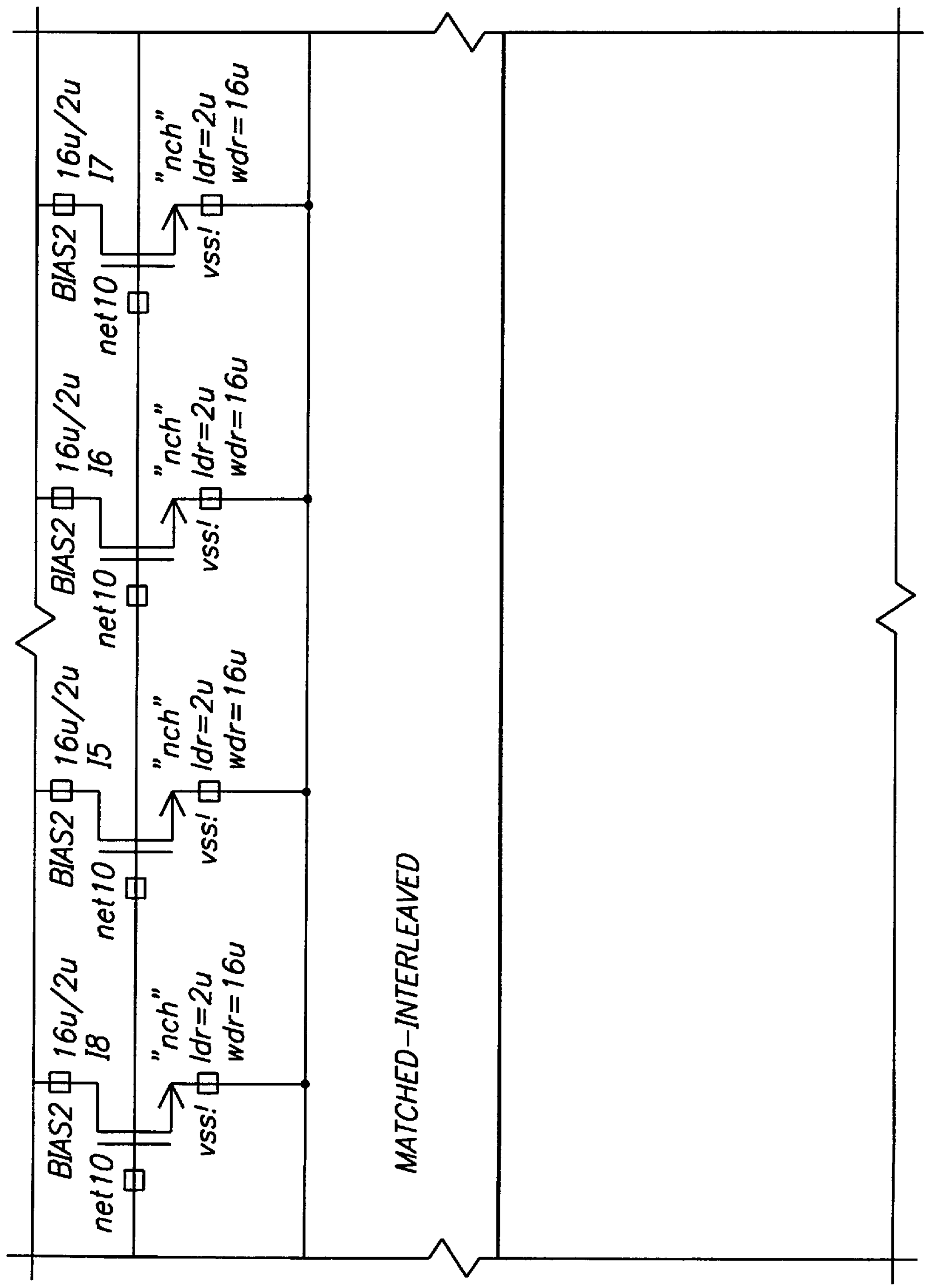
Fig. 9.010.4BD

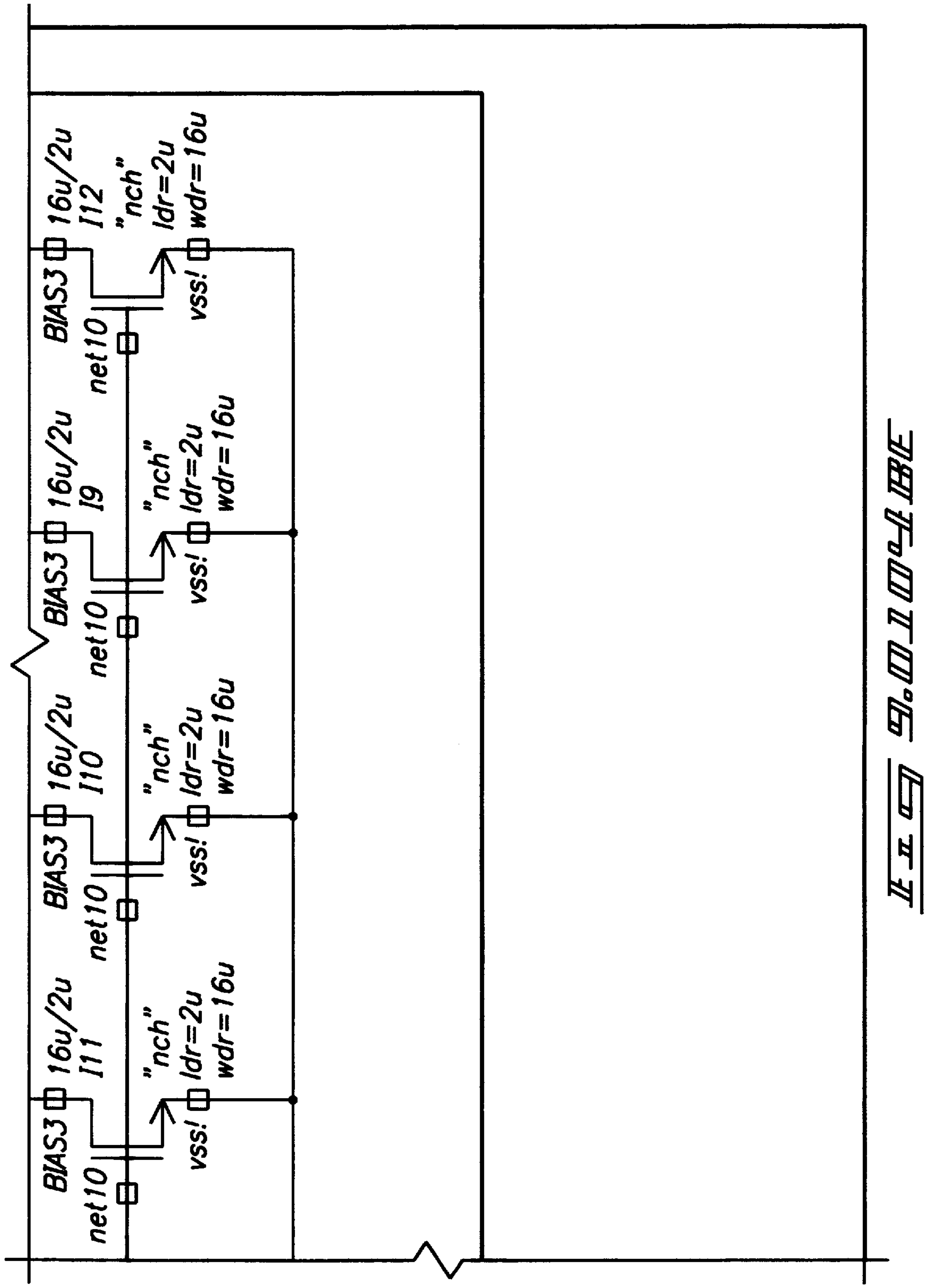
FIG. 9.10.4BE

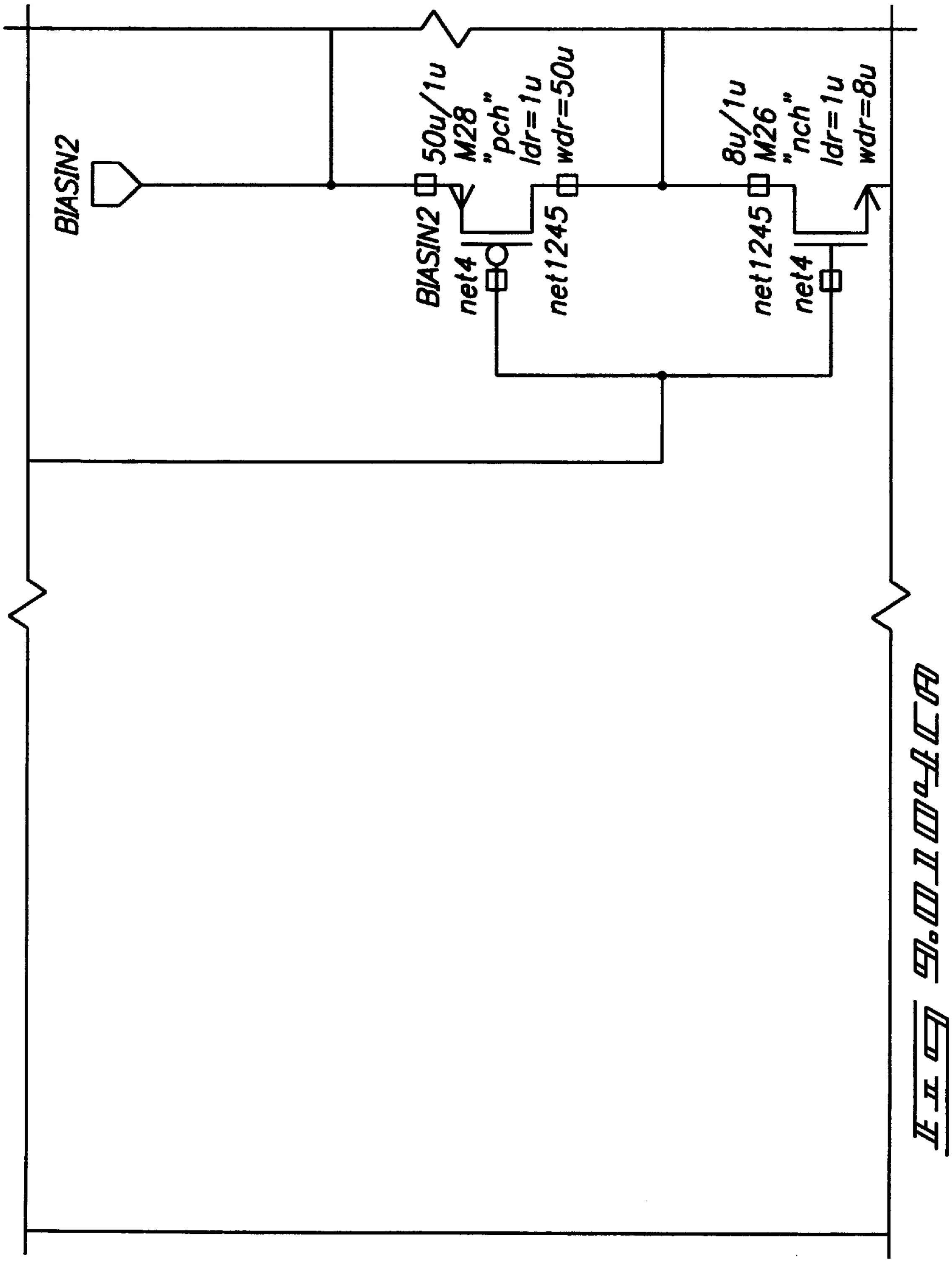
FIG. 9.010.4CA

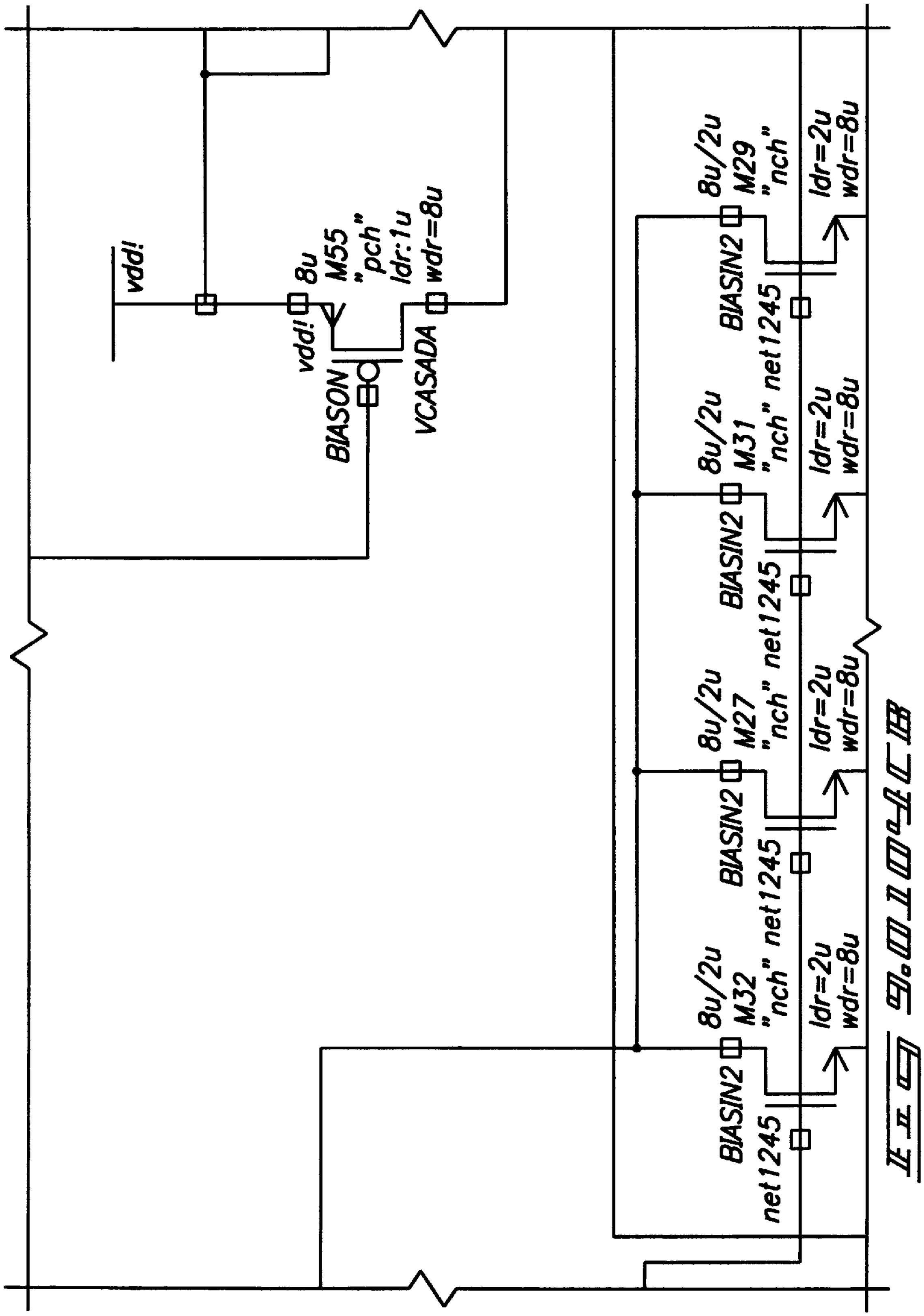
FIG. 9.00104CB

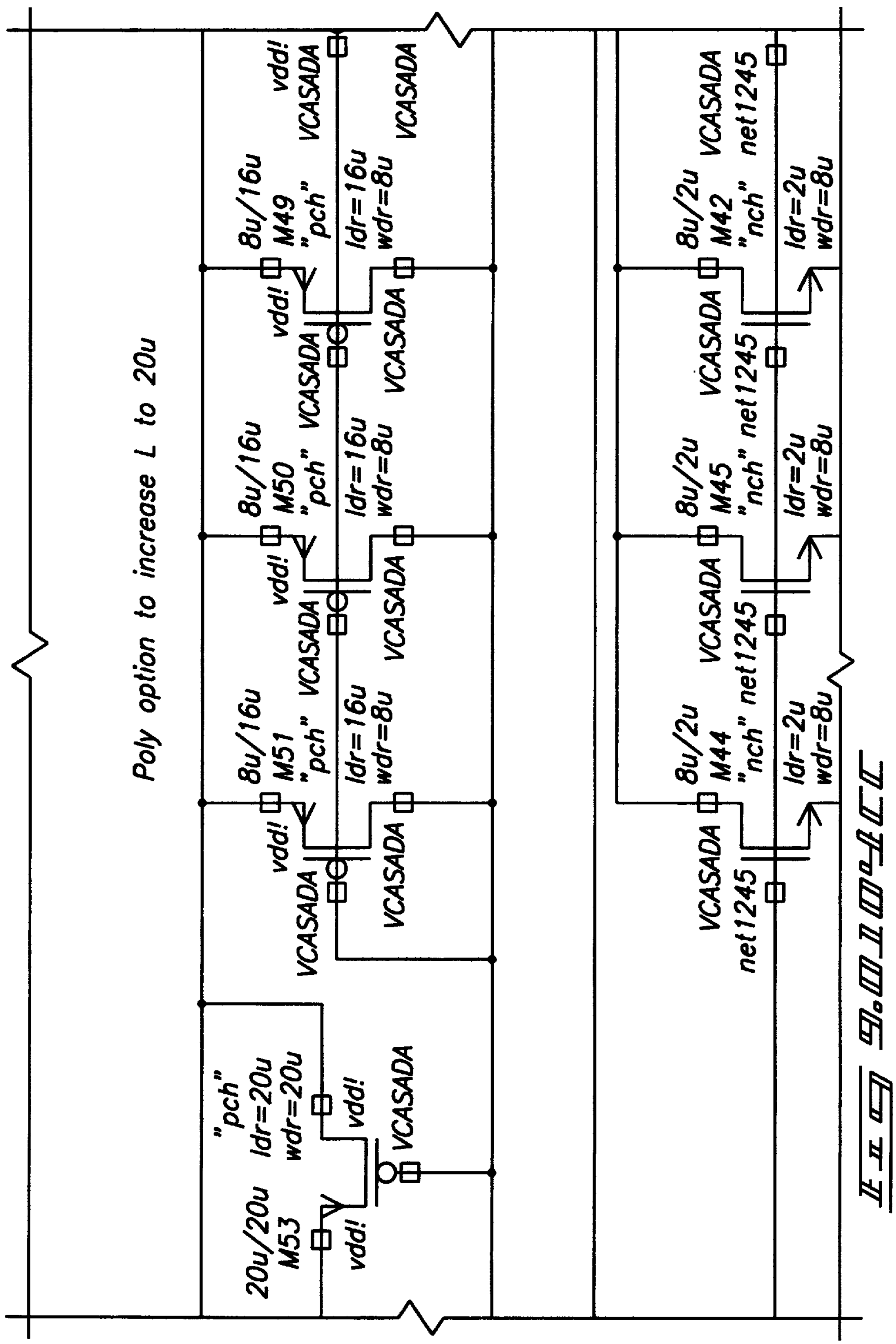
FIG. 9.104CC

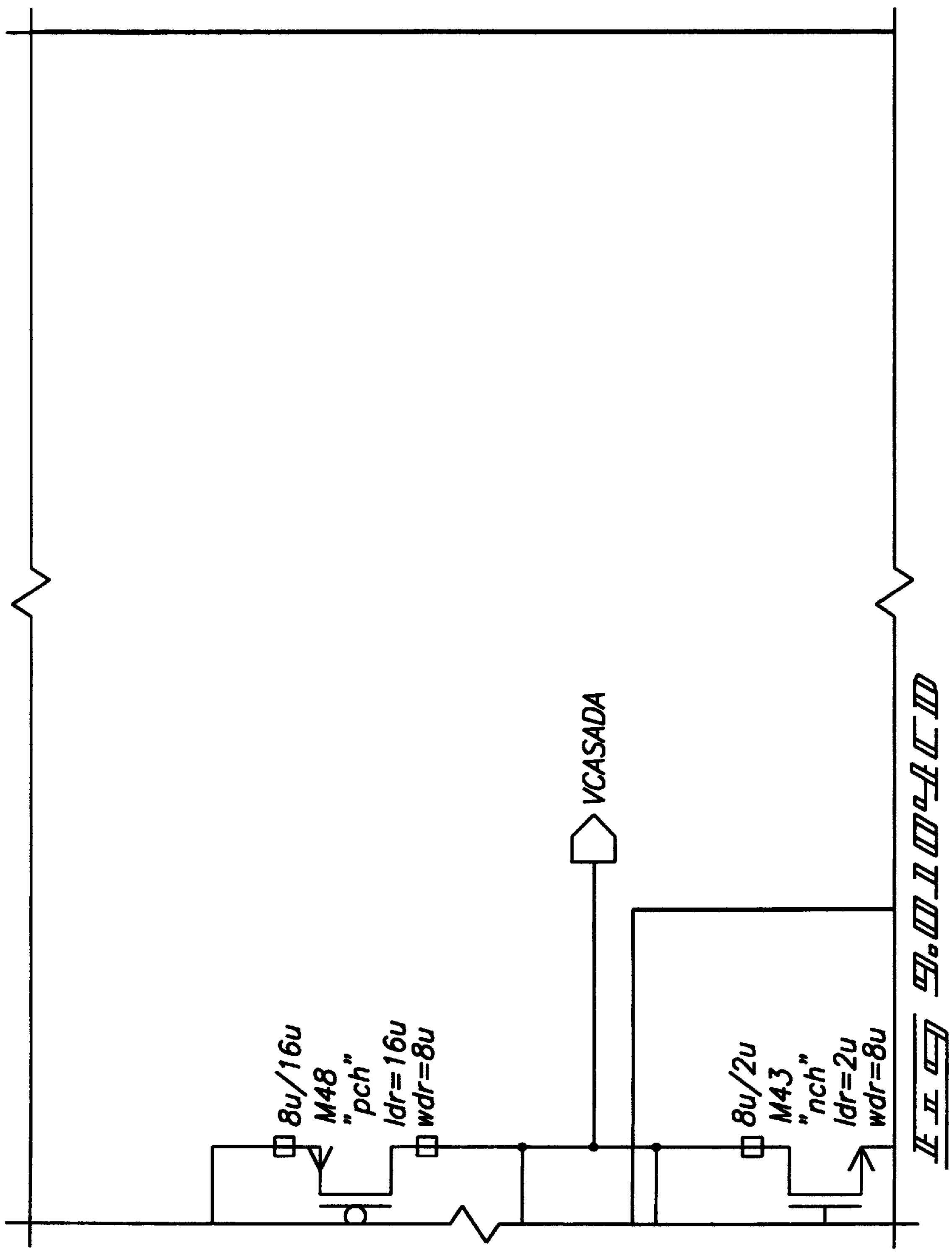
FIG. 9.10-4CD

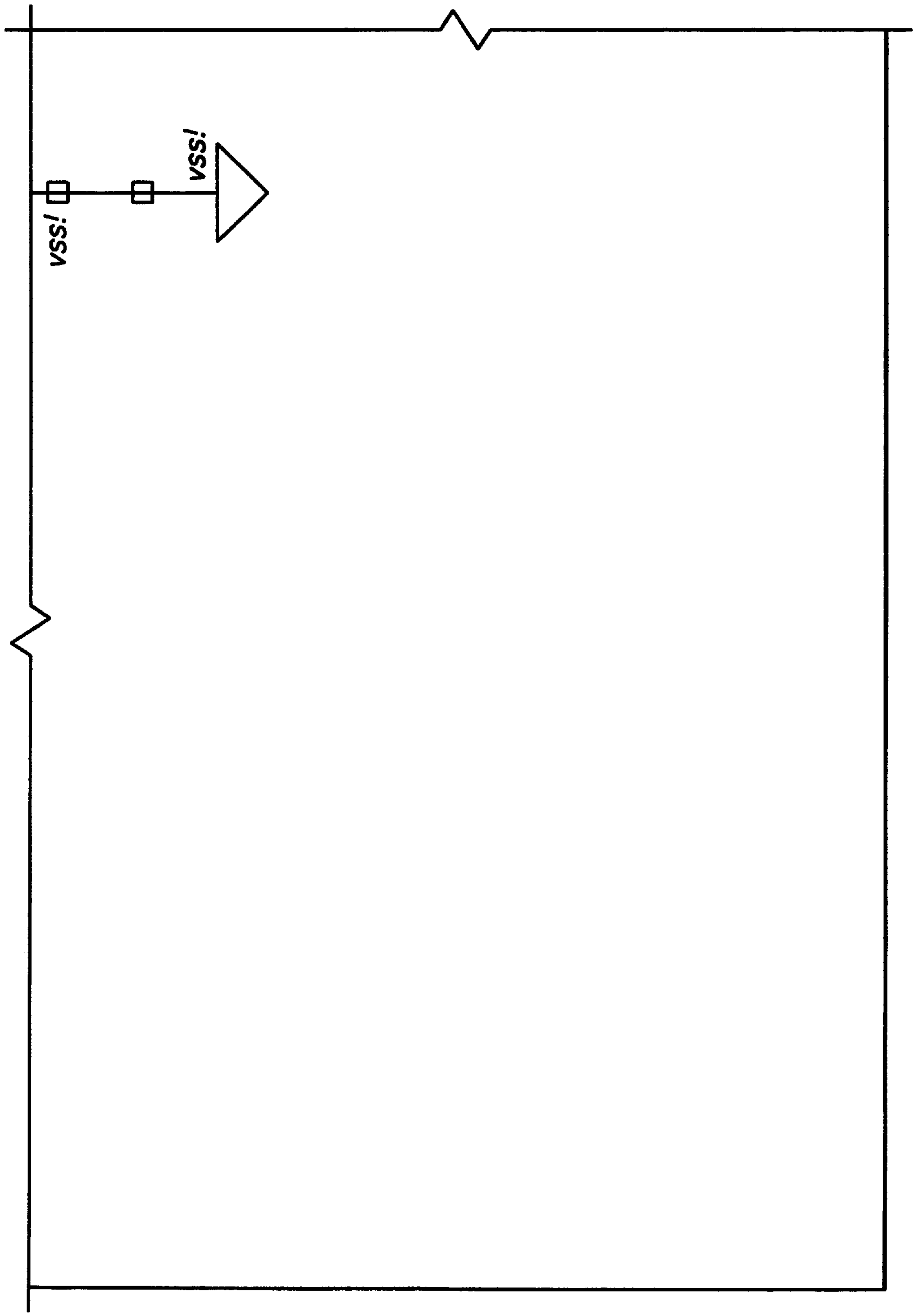
FIG. 9.0104DA

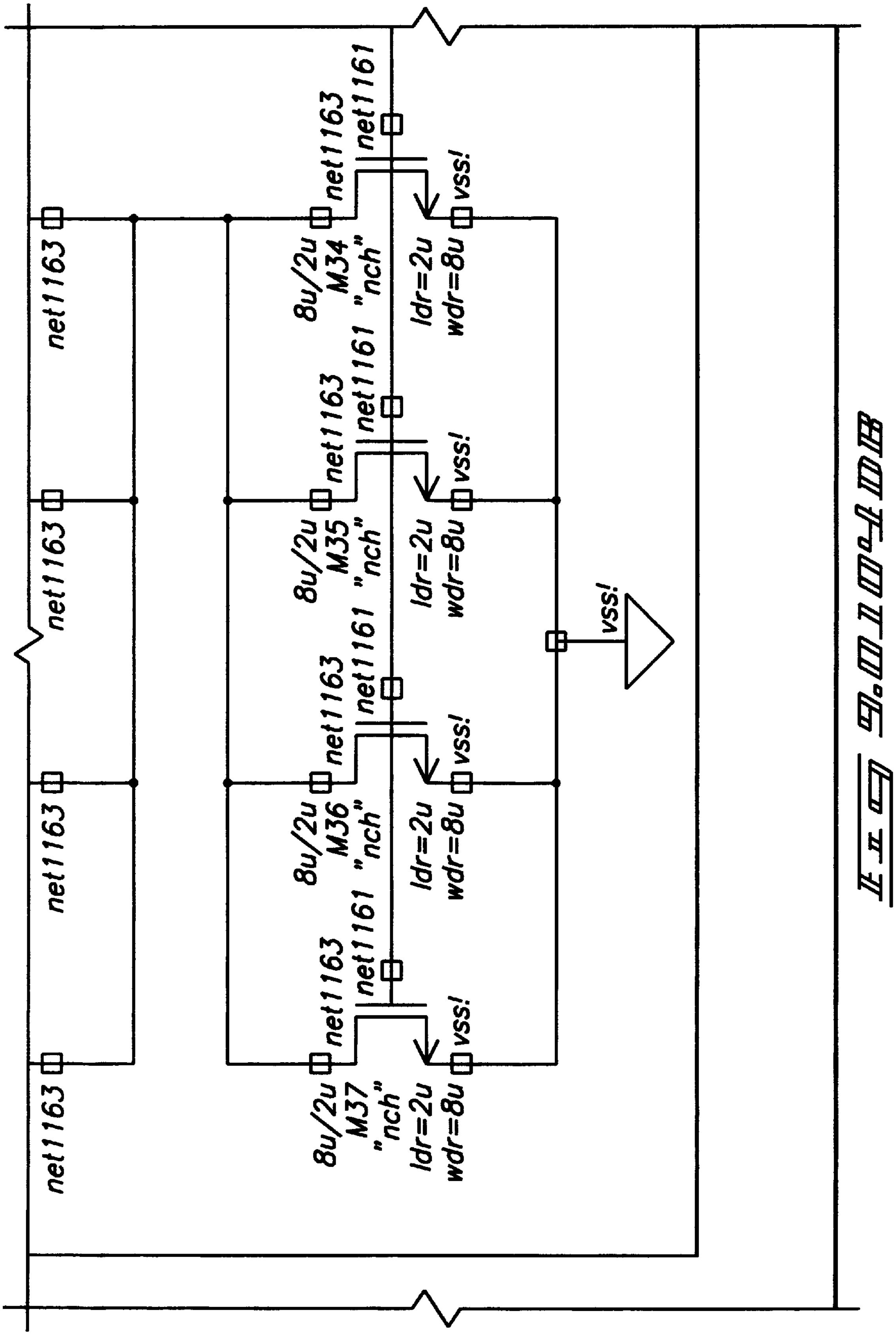
FIG. 9.010.40B

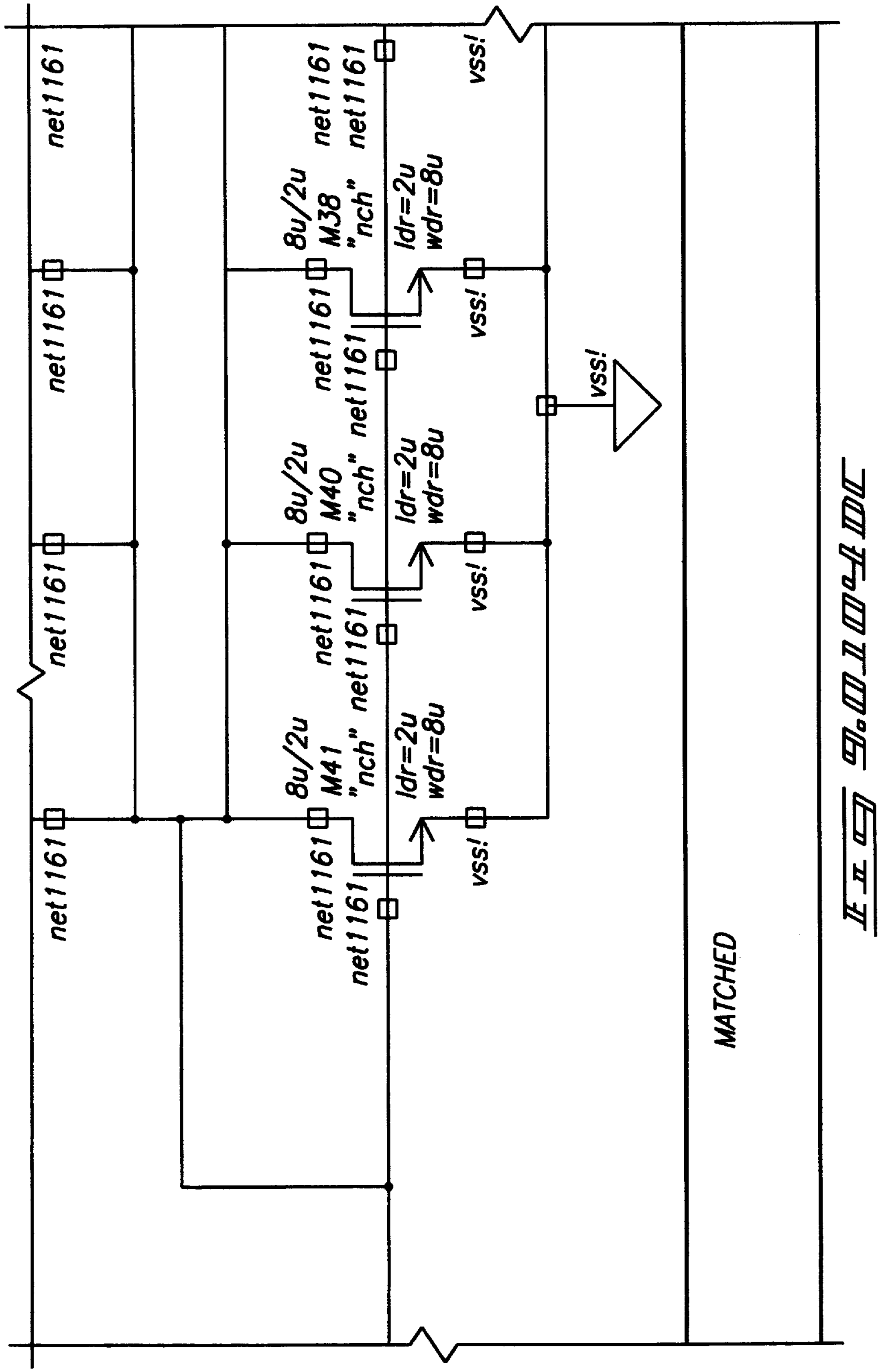
net1161
8u/2u
M38
"nch"
ldr=2u
wdr=8u
M40
M41
vss!
MATCHED

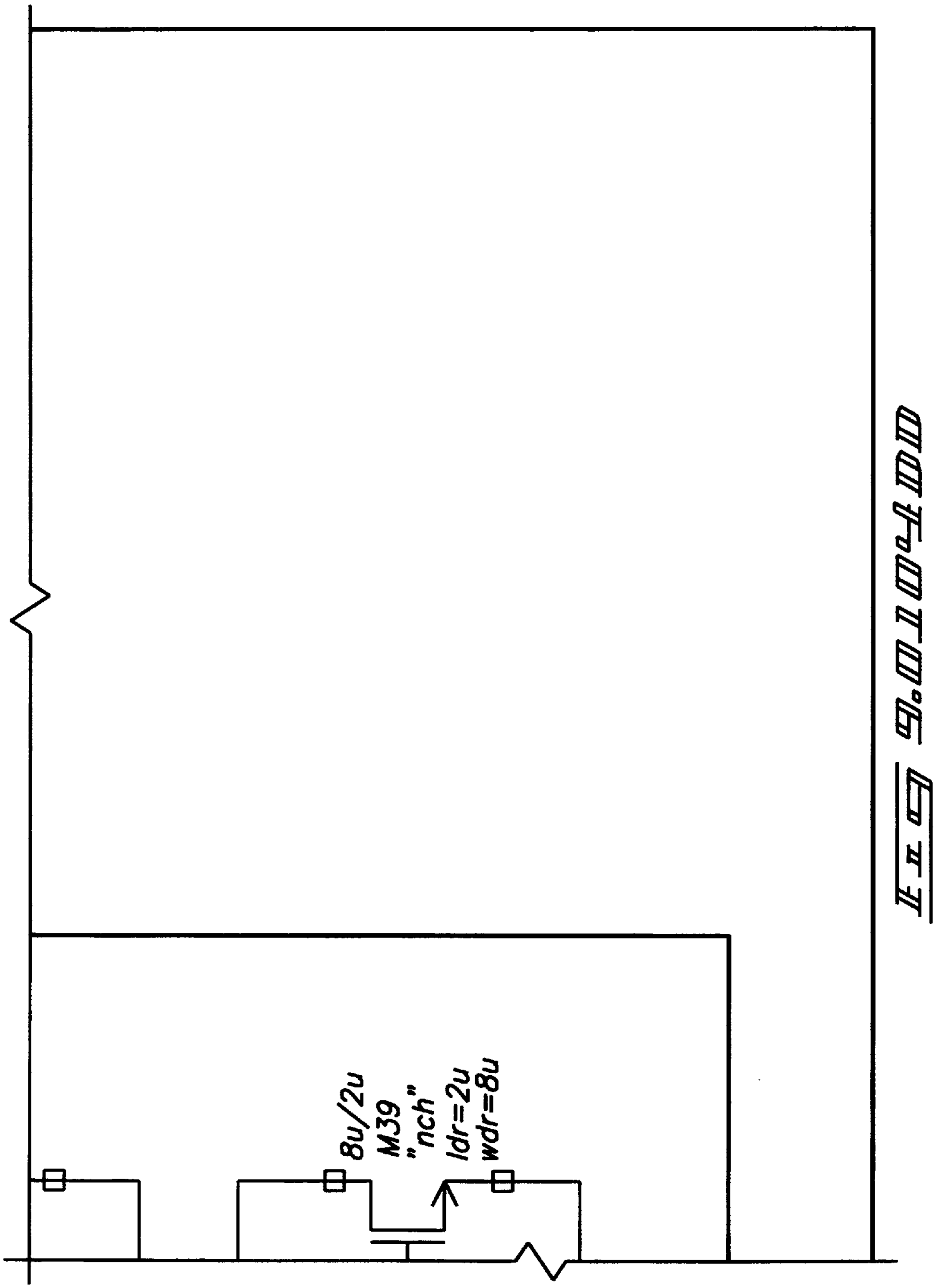
FIG. 9.0104DD

| | | | | | | | | | | |
|---|---|---|---|---|---|---|---|---|---|---|
| 9.02AA | 9.02AB | 9.02AC | 9.02AD | 9.02AE | 9.02AF | 9.02AG | 9.02AH | 9.02AI | 9.02AJ | 9.02AK |
| 9.02BA | 9.02BB | 9.02BC | 9.02BD | 9.02BE | 9.02BF | 9.02BG | 9.02BH | 9.02BI | 9.02BJ | 9.02BK |
| 9.02CA | | 9.02CC | 9.02CD | 9.02CE | 9.02CF | 9.02CG | 9.02CH | 9.02CI | 9.02CJ | 9.02CK |
| 9.02DA | 9.02DB | 9.02DC | 9.02DD | | 9.02DF | 9.02DG | 9.02DH | 9.02DI | 9.02DJ | 9.02DK |

Fig 9.02

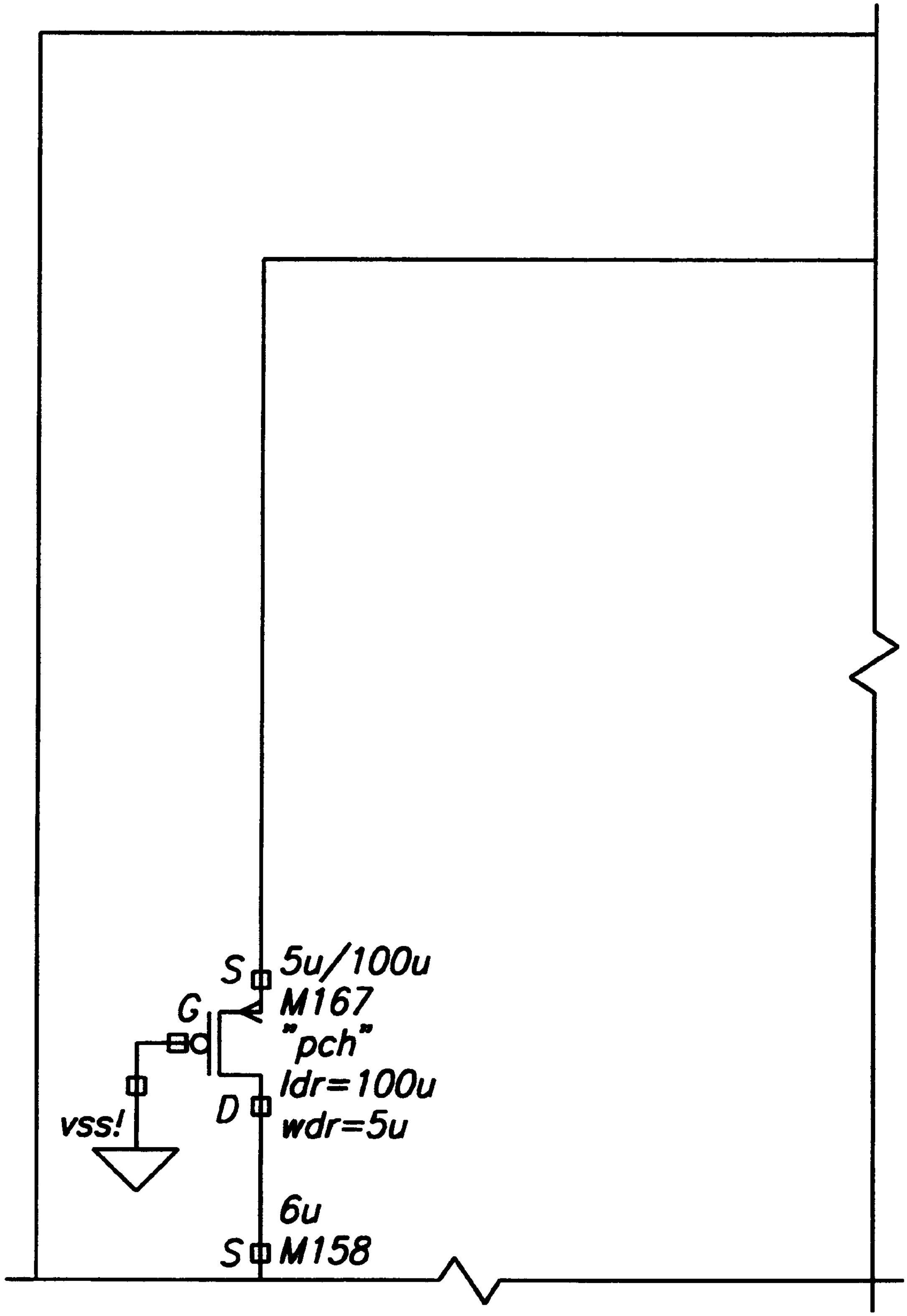
FIG 9.02AA

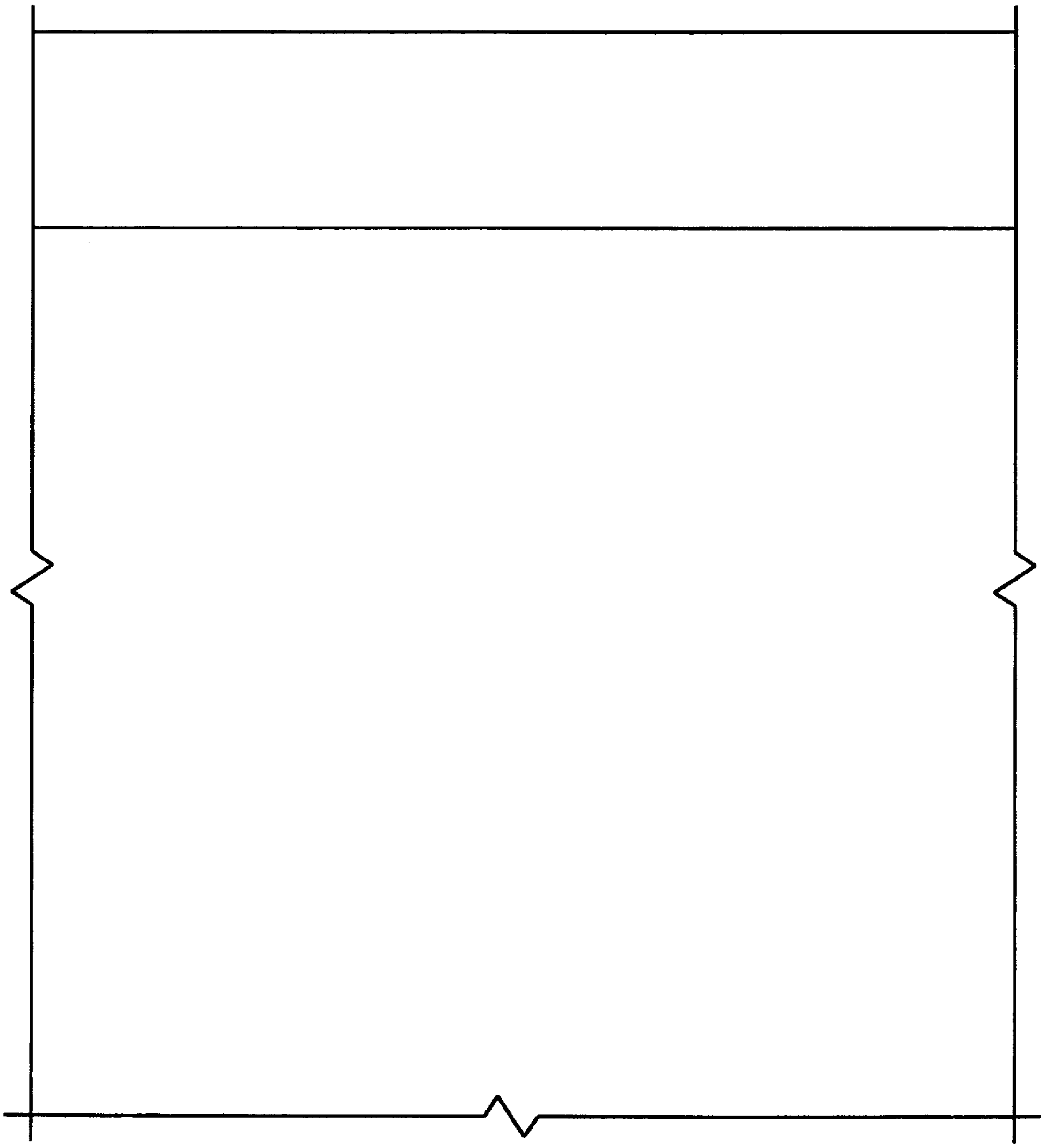
FIG 9.02AB

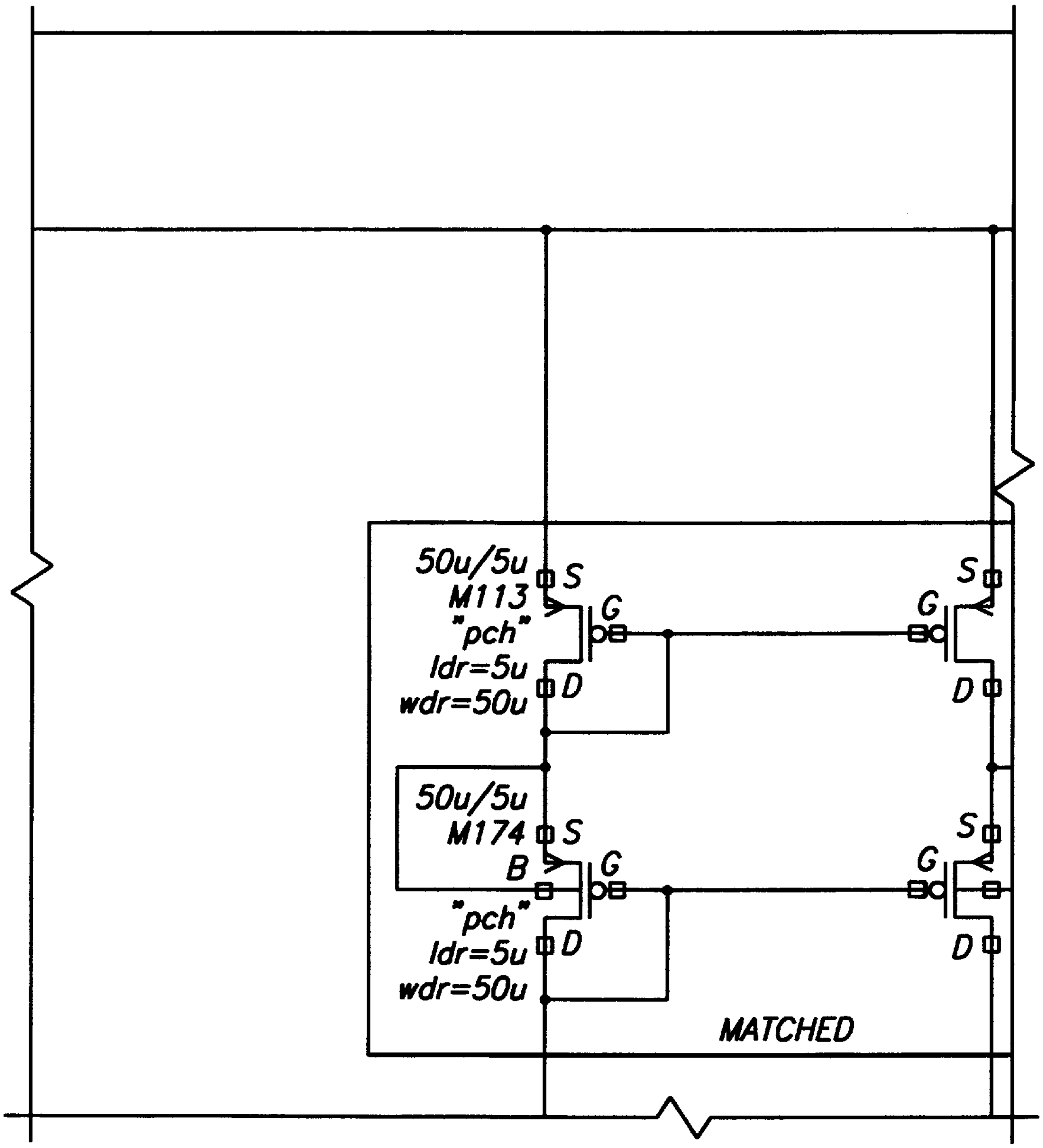
Fig 9.02AC

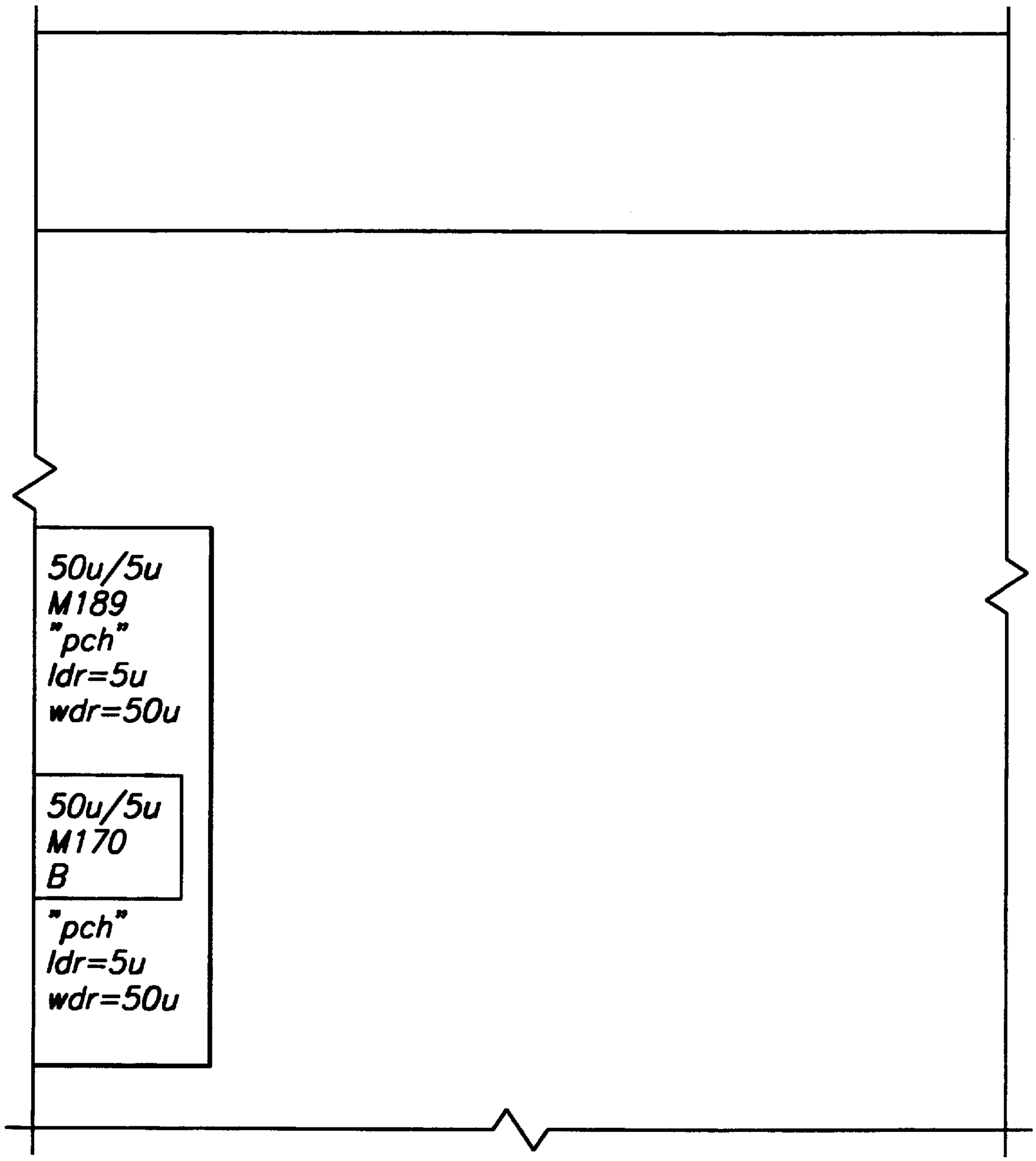
FIG. 9.02AD

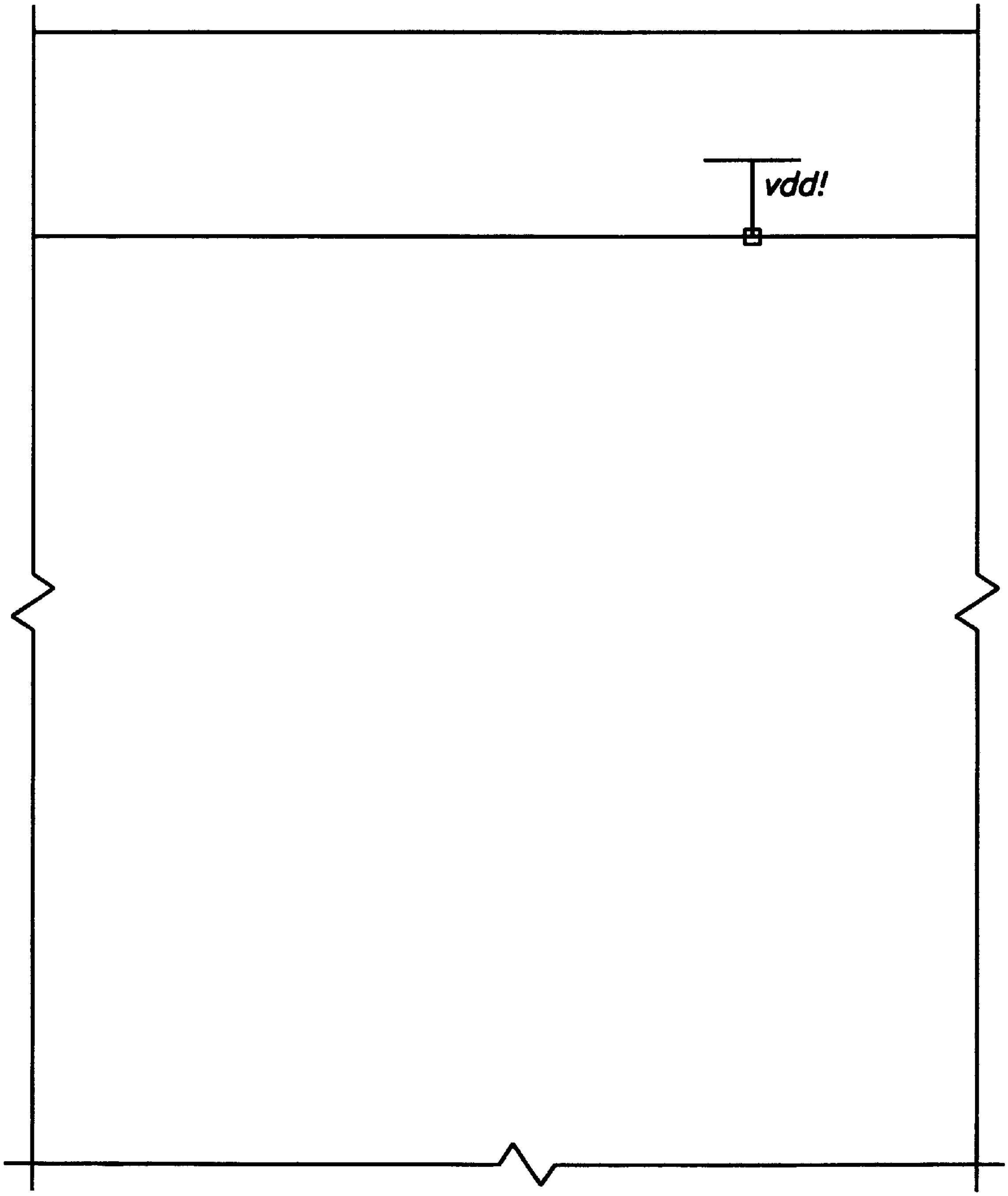
Fig 9.02AE

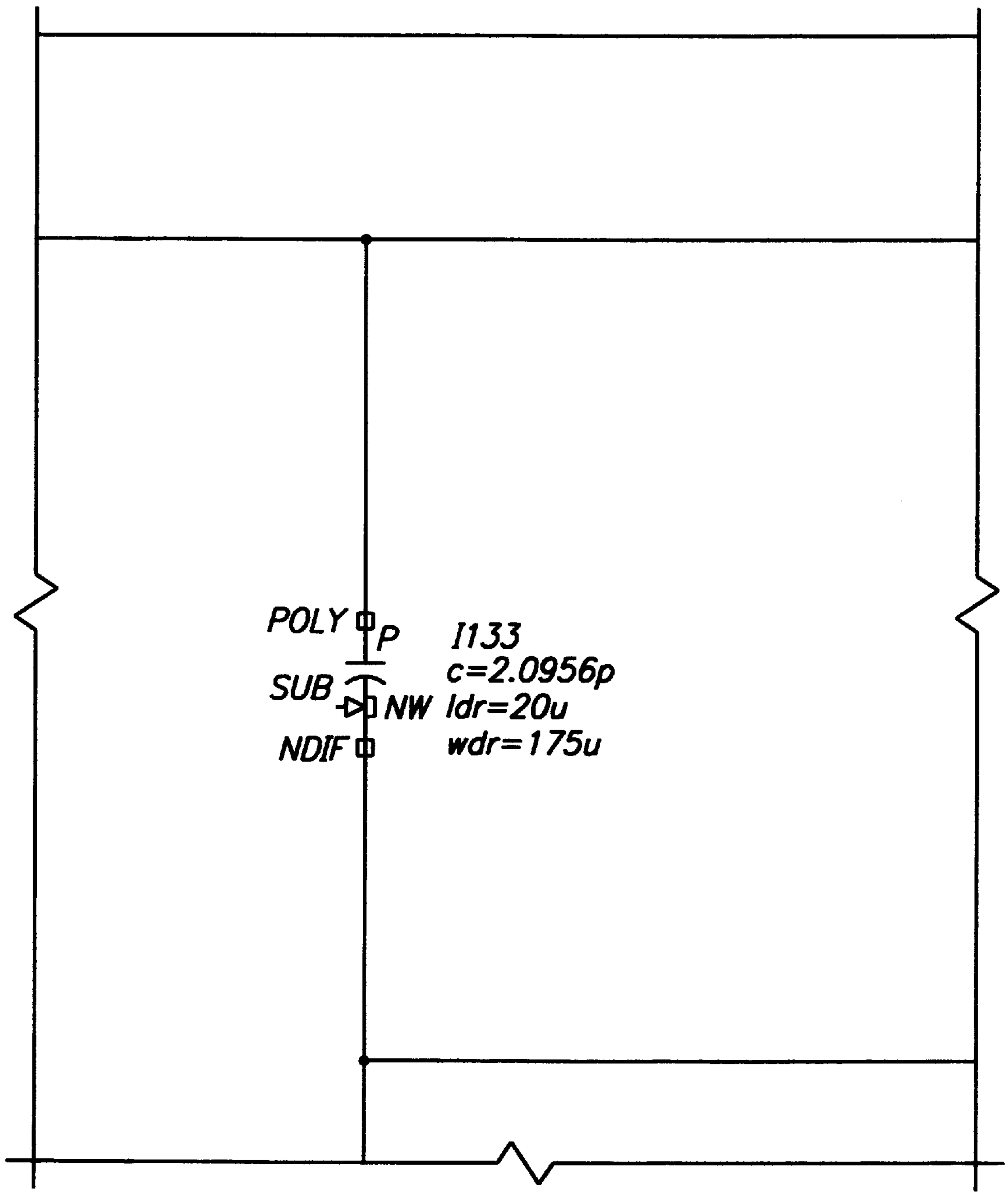
Fig 9.02AF

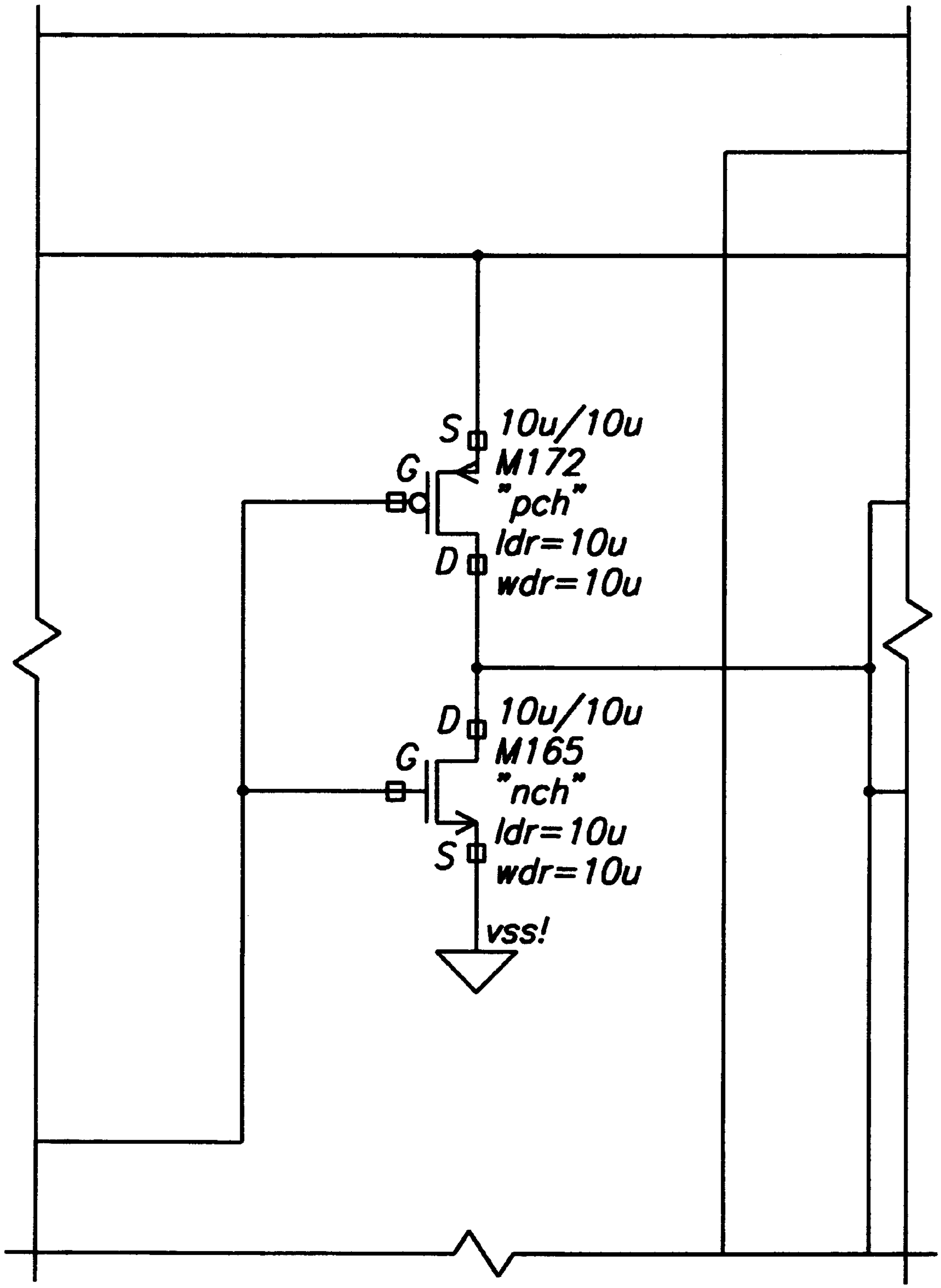
Fig 9.02AG

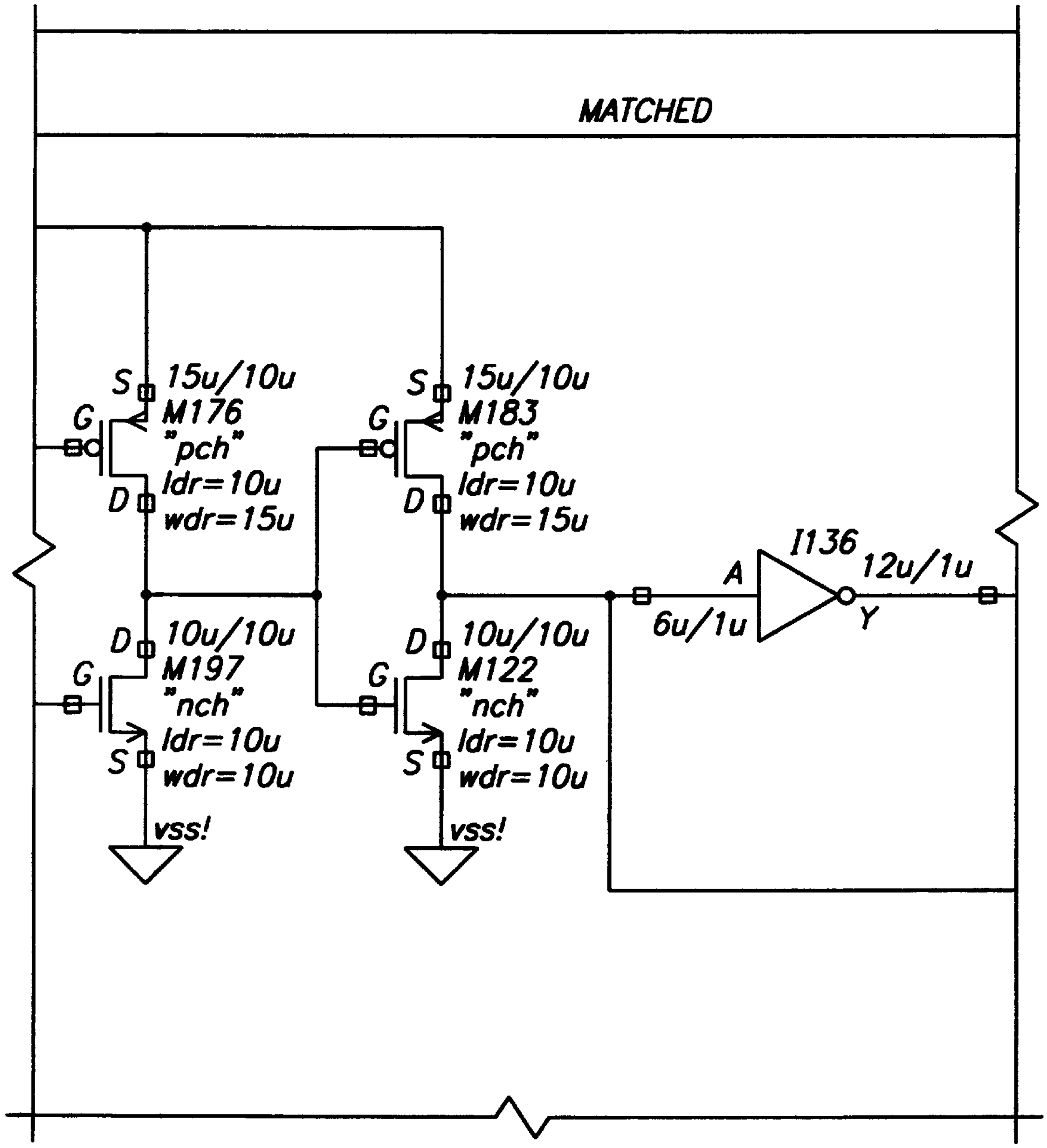
Fig 9.02AH

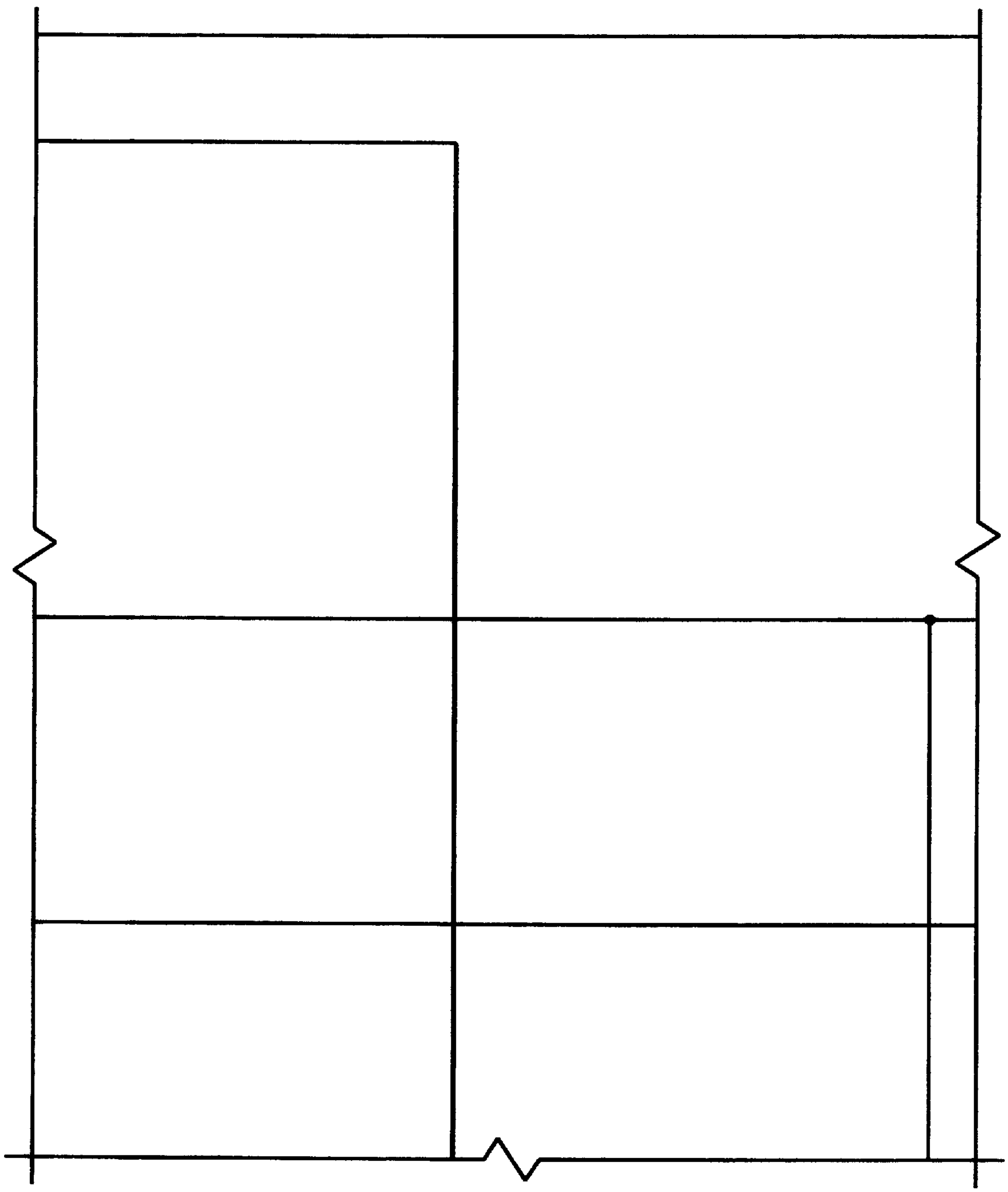
Fig 9.02AI

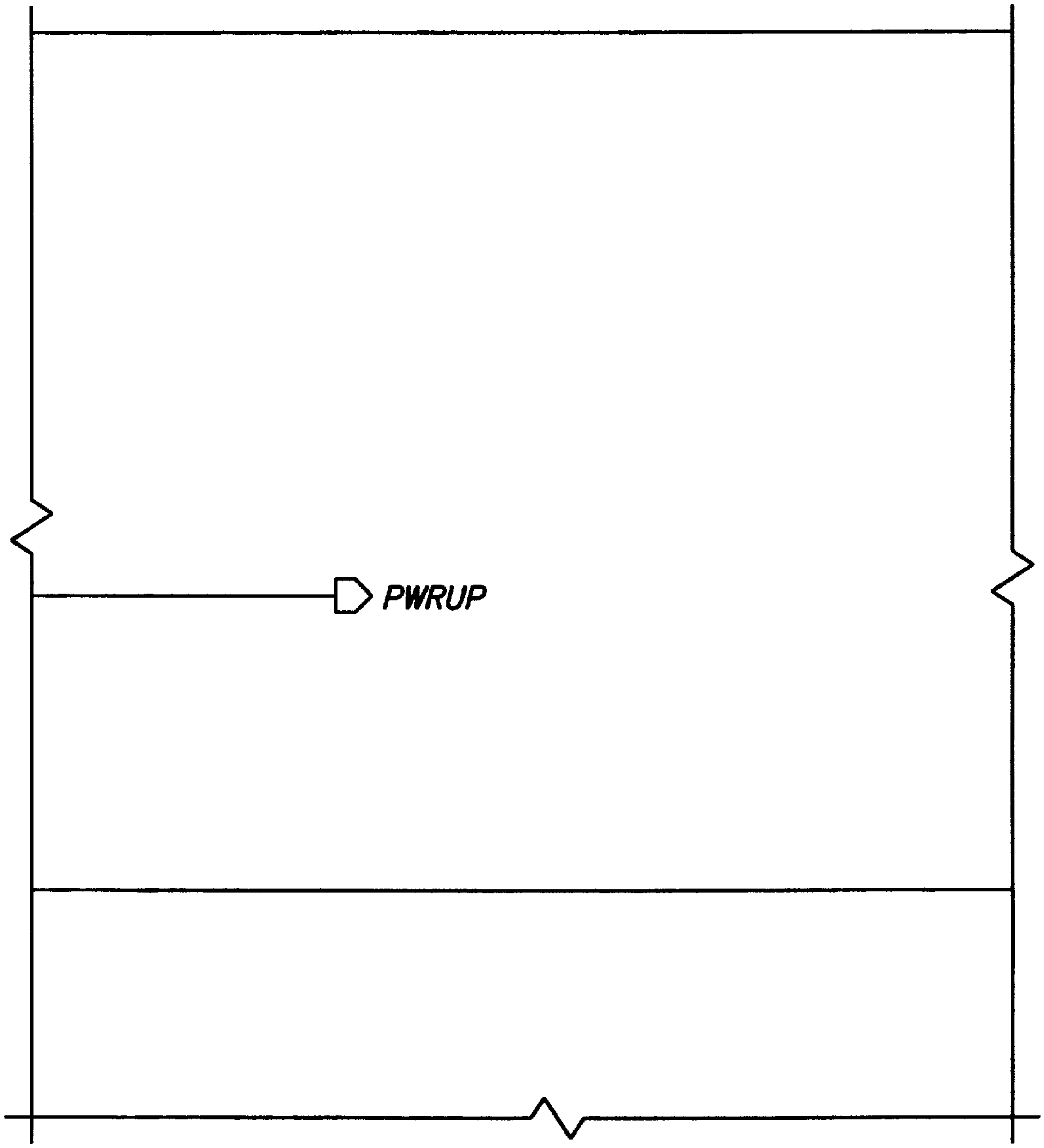
Fig 9.02AJ

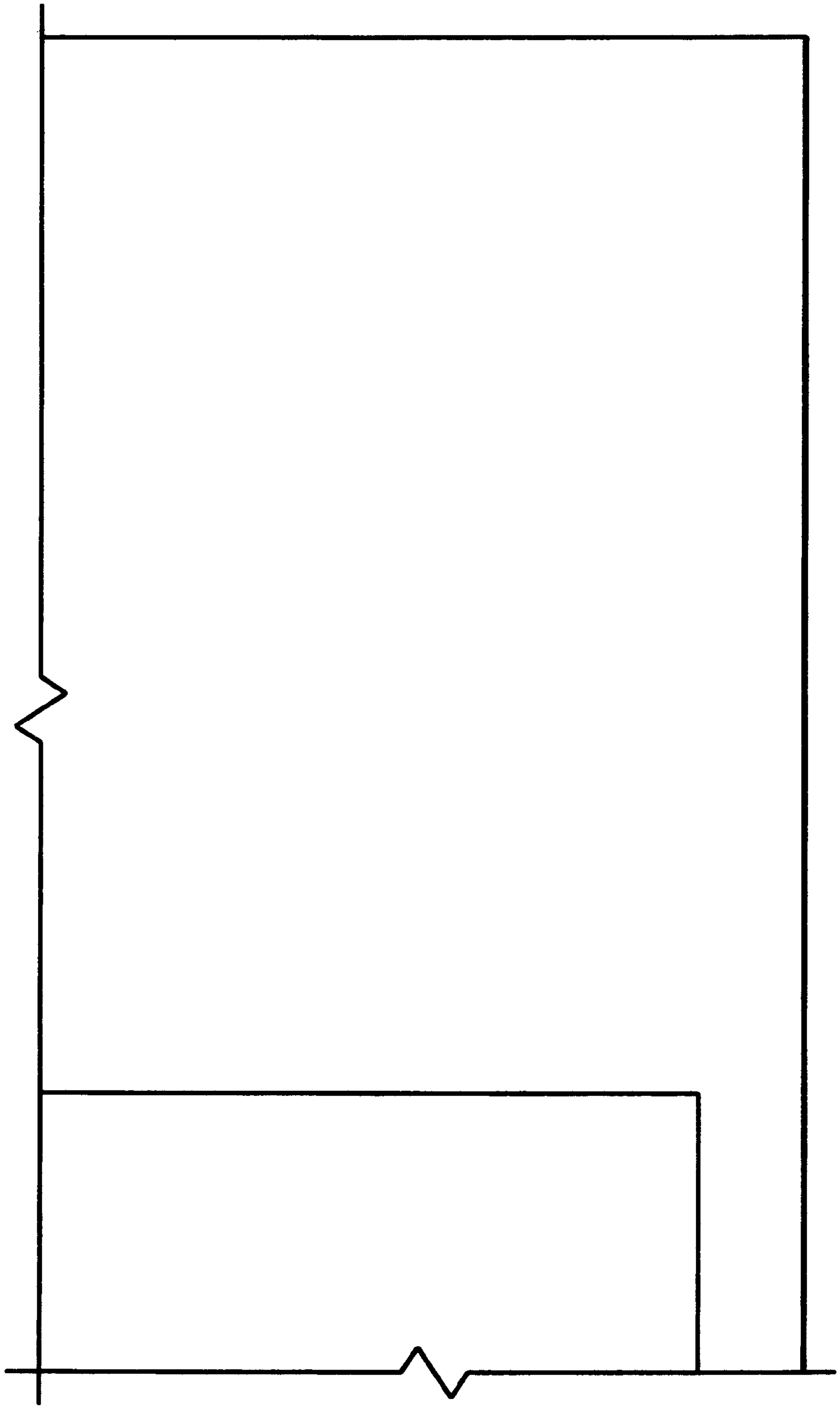
FIG. 9.02AK

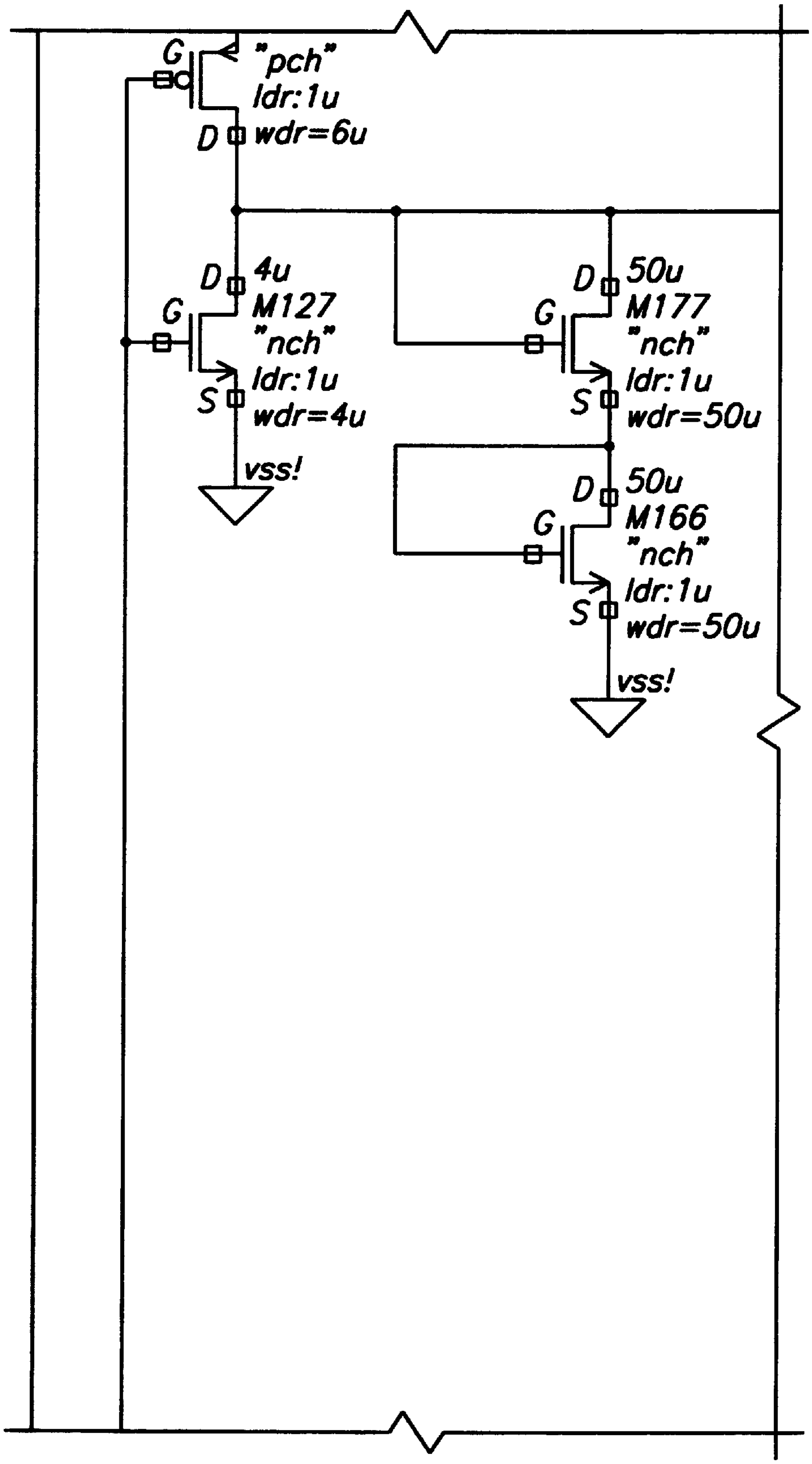
Fig 9.02BA

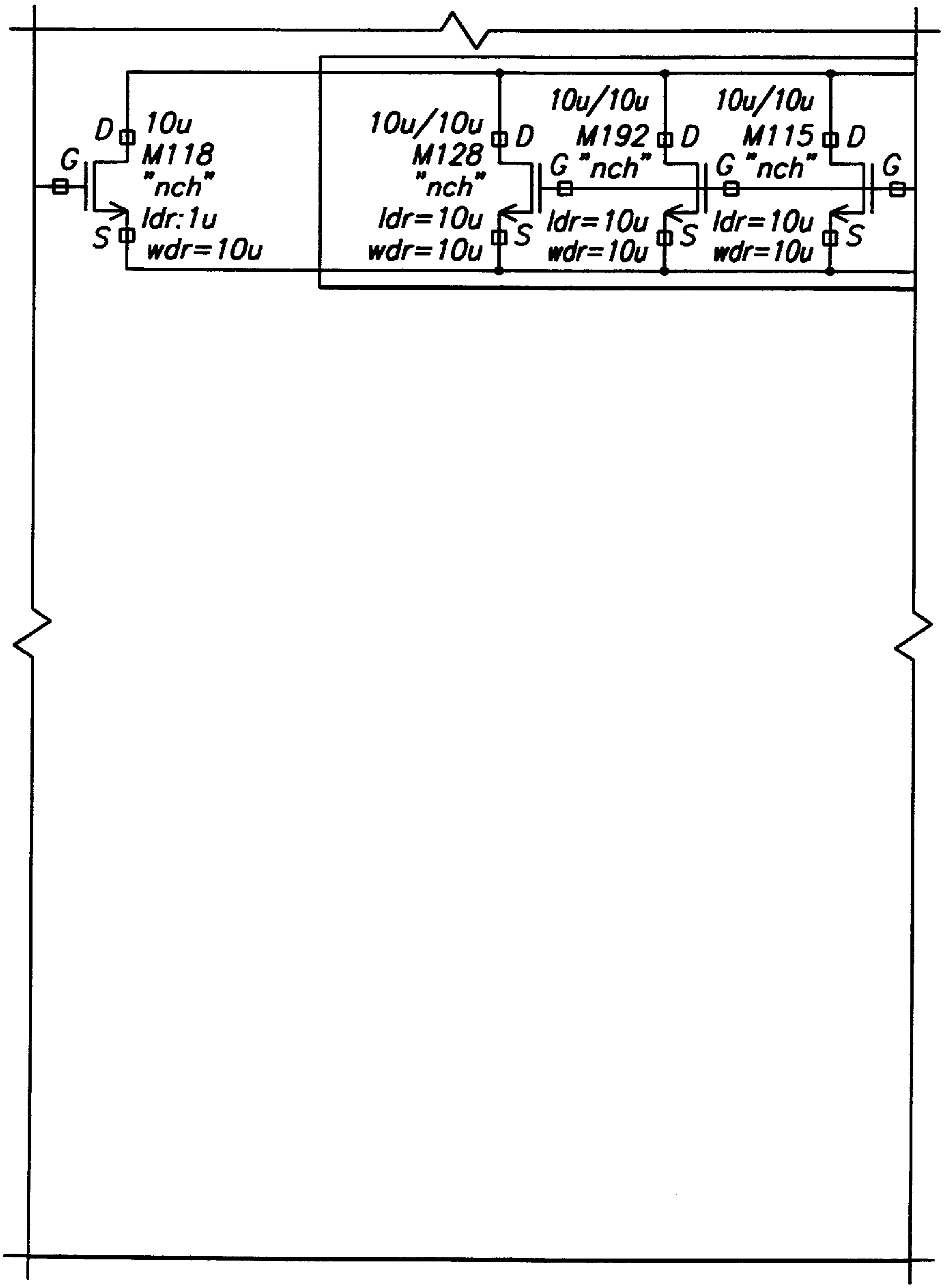
FIG. 9.02BB

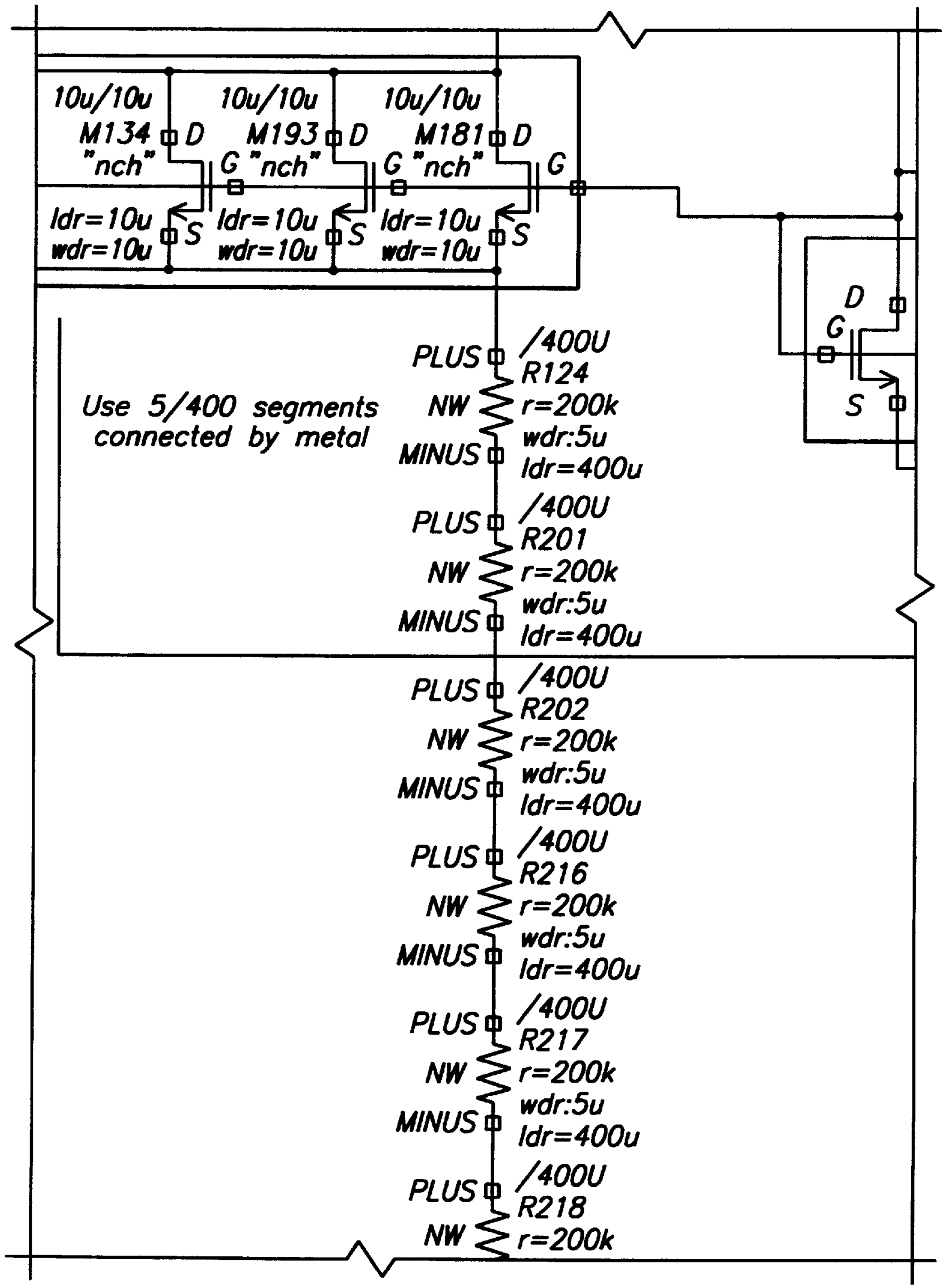
Fig 9.02BC

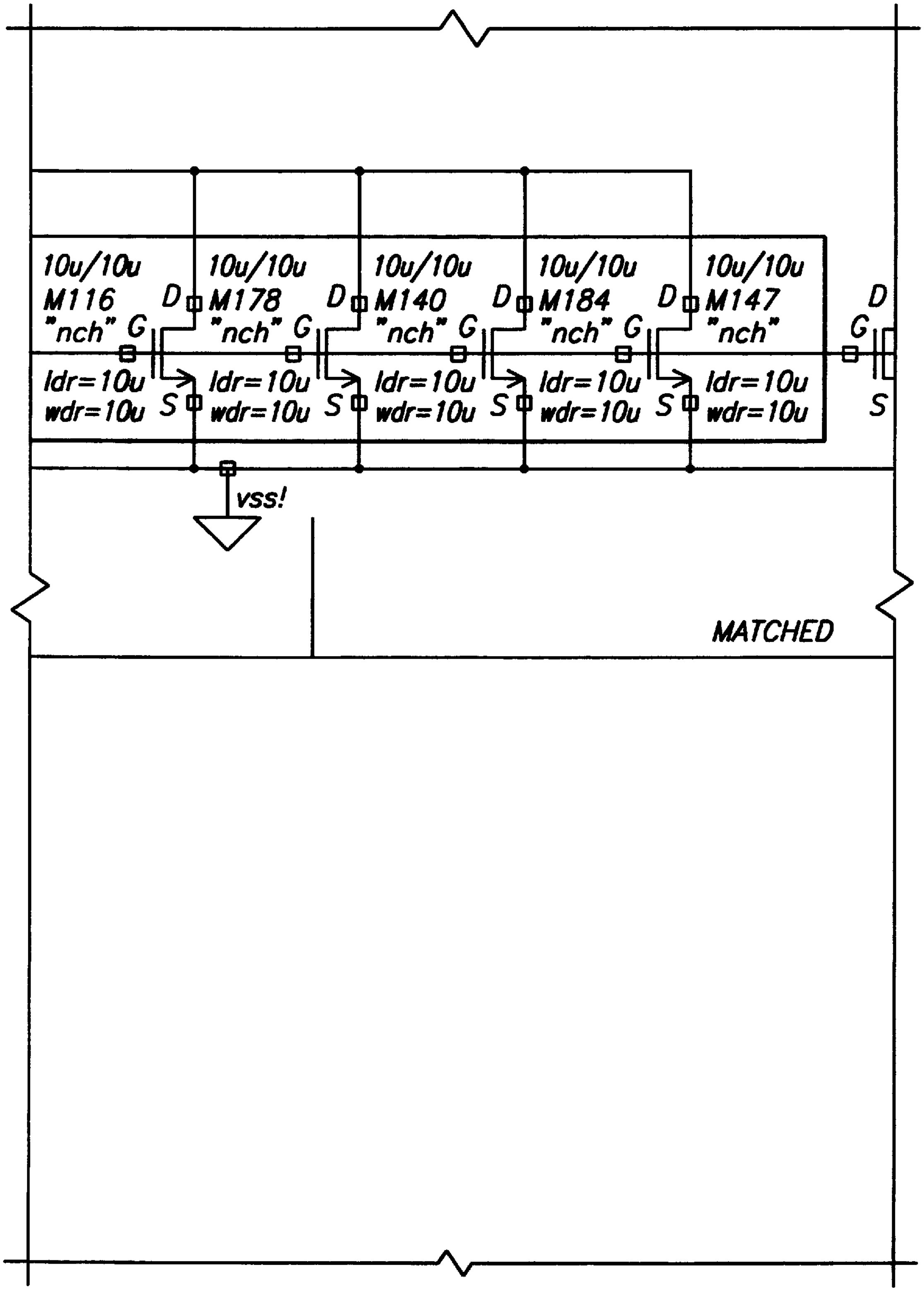
Fig 9.02BD

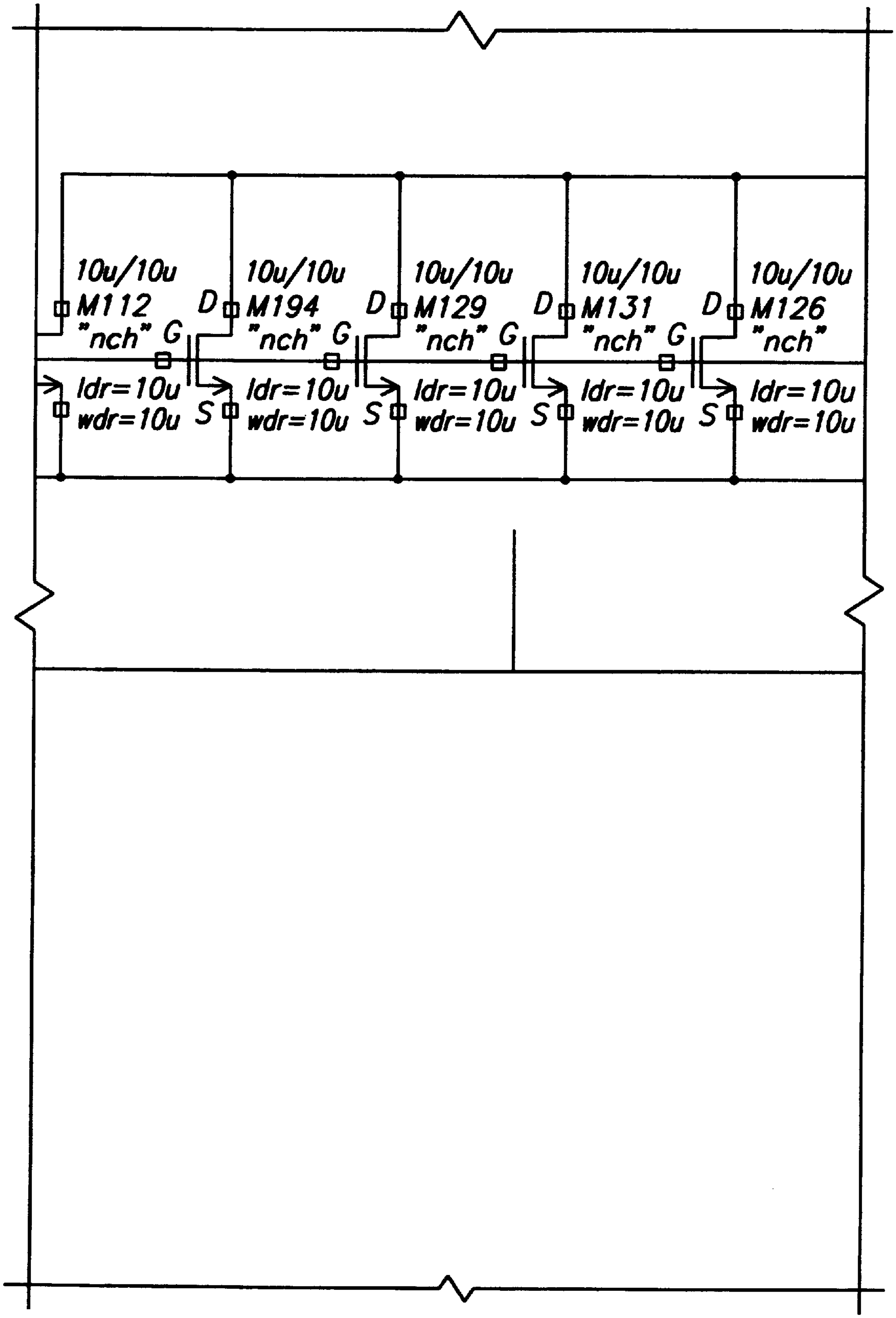
FIG 9.02BE

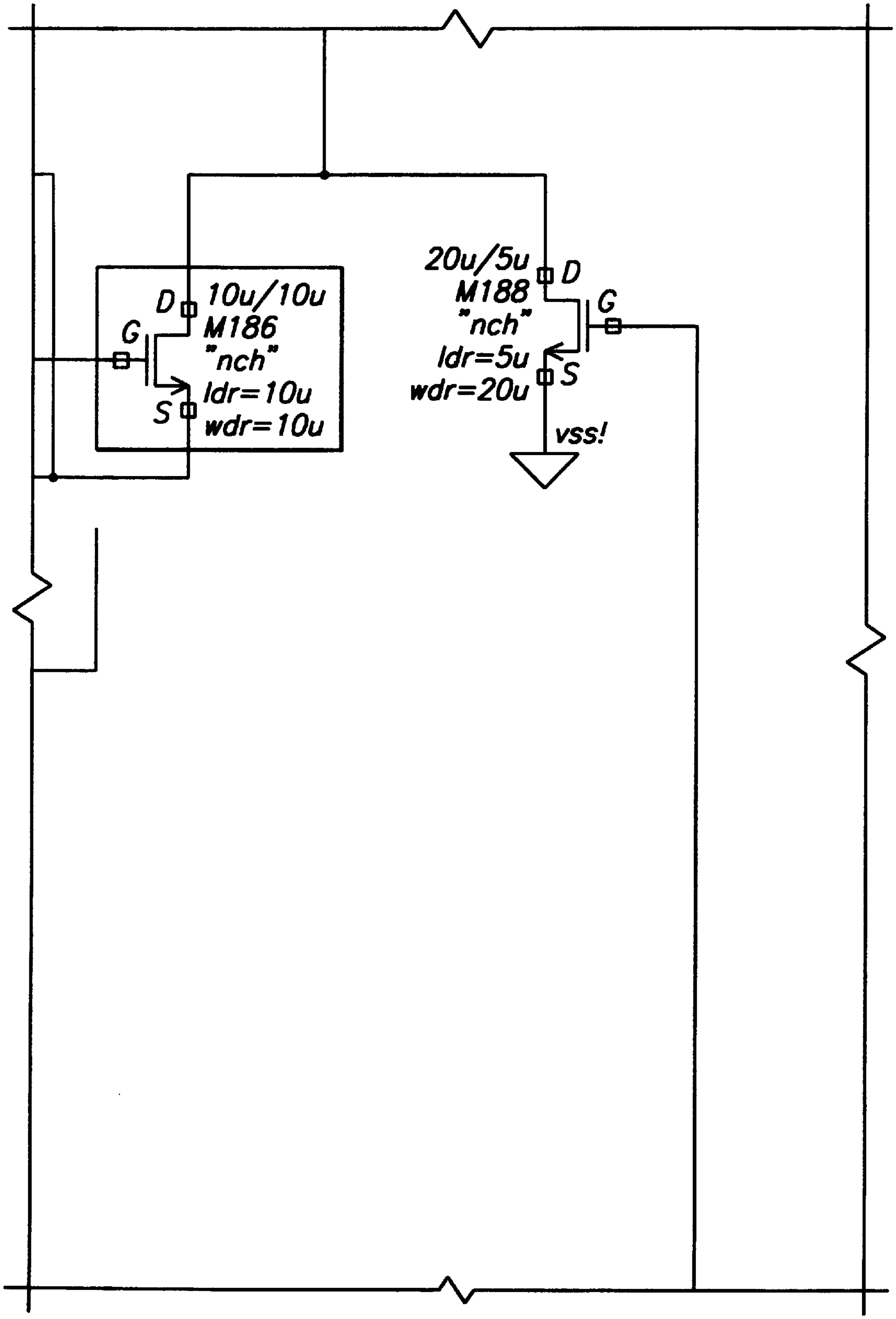
Fig 9.02BF

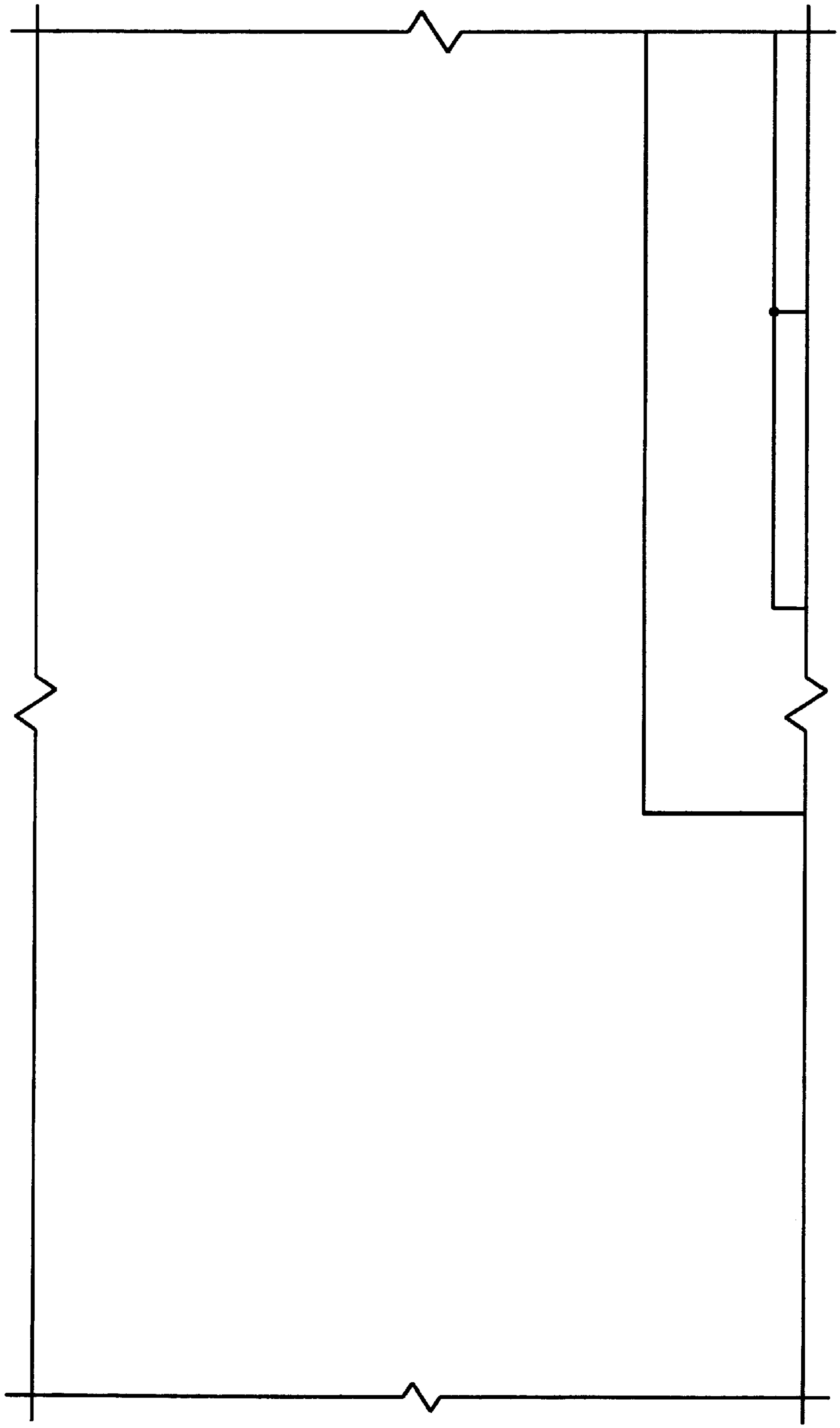
FIG. 9.02BG

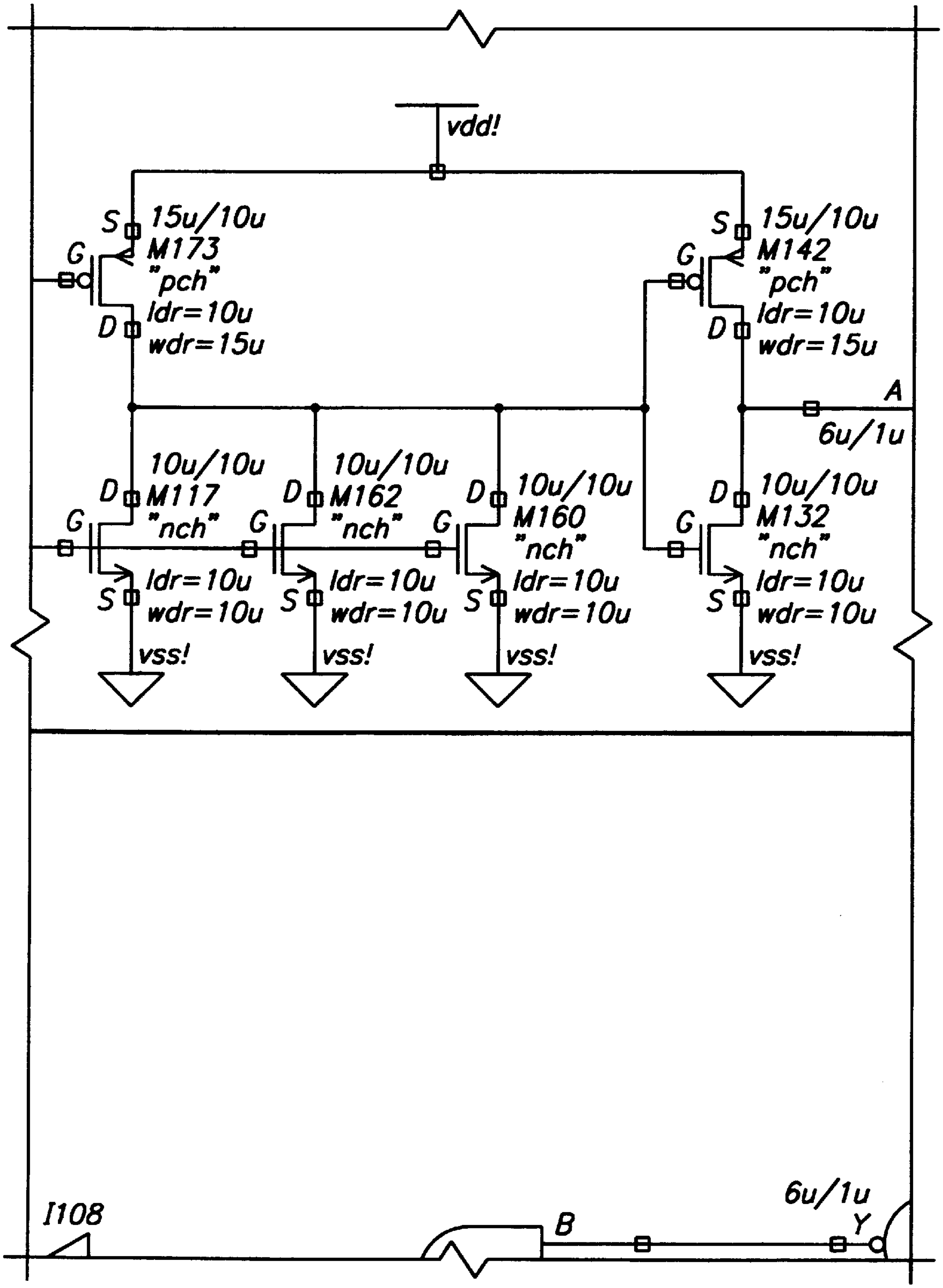
Fig 9.02BH

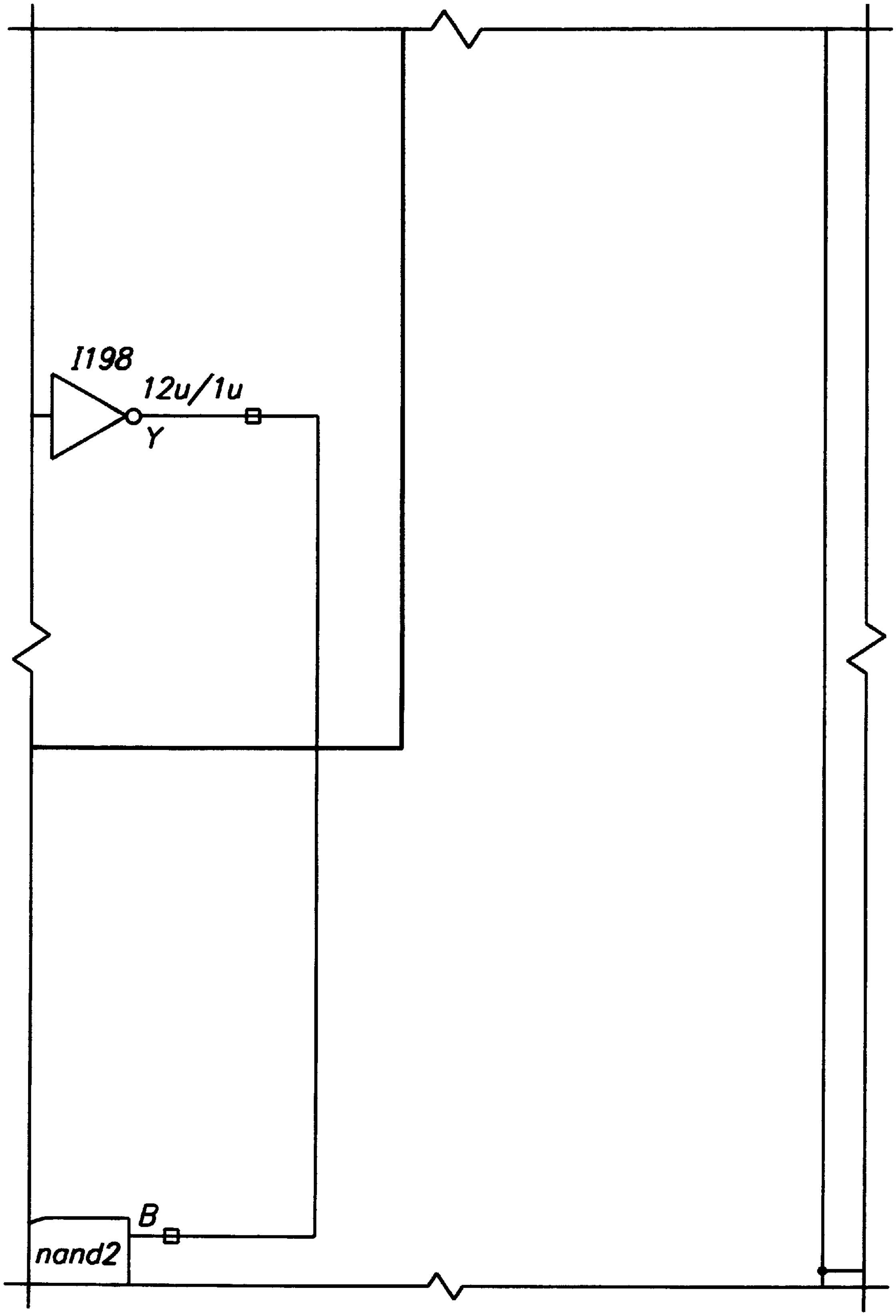
Fig 9.02BI

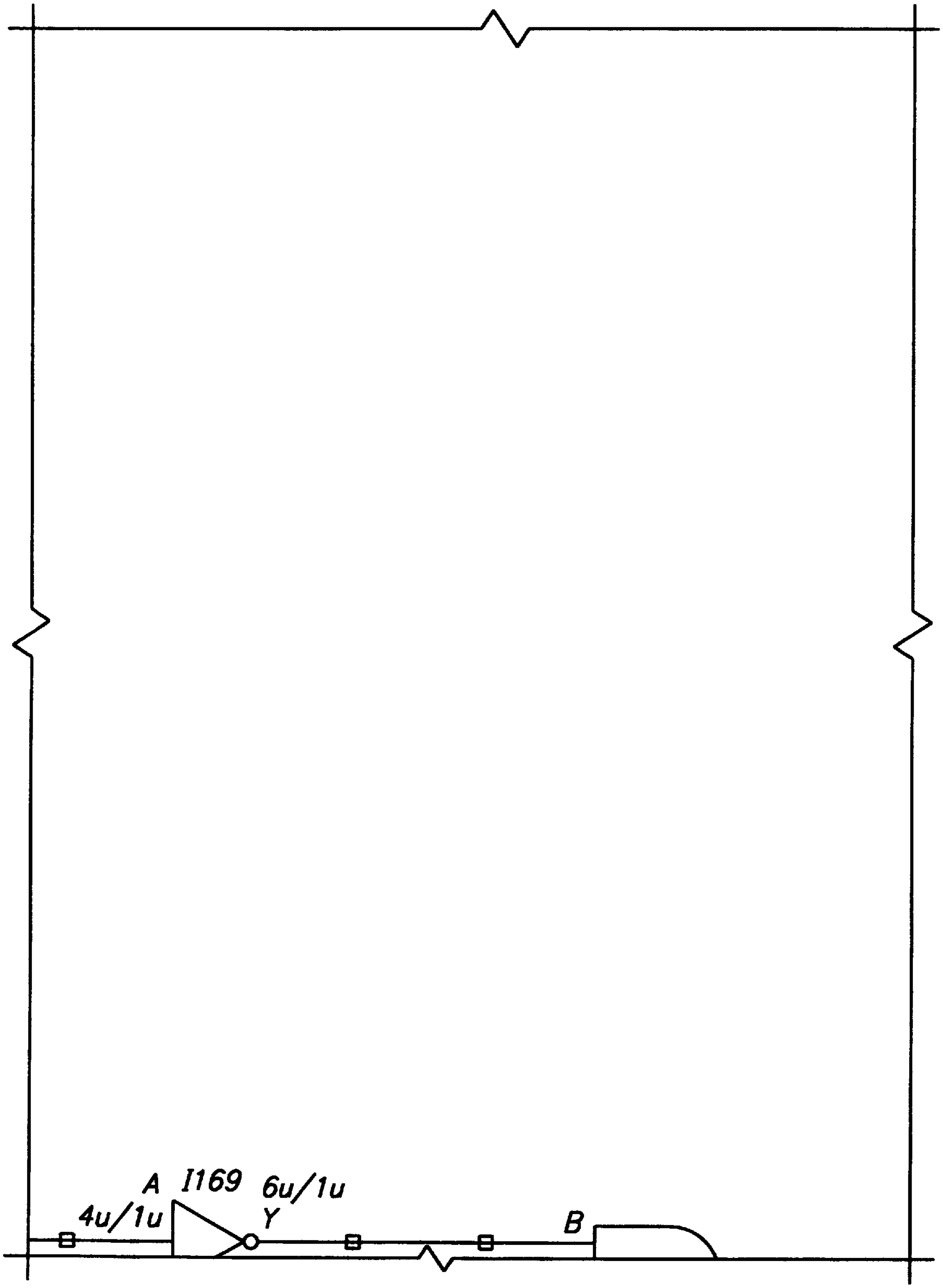
Fig. 9.02Ba1

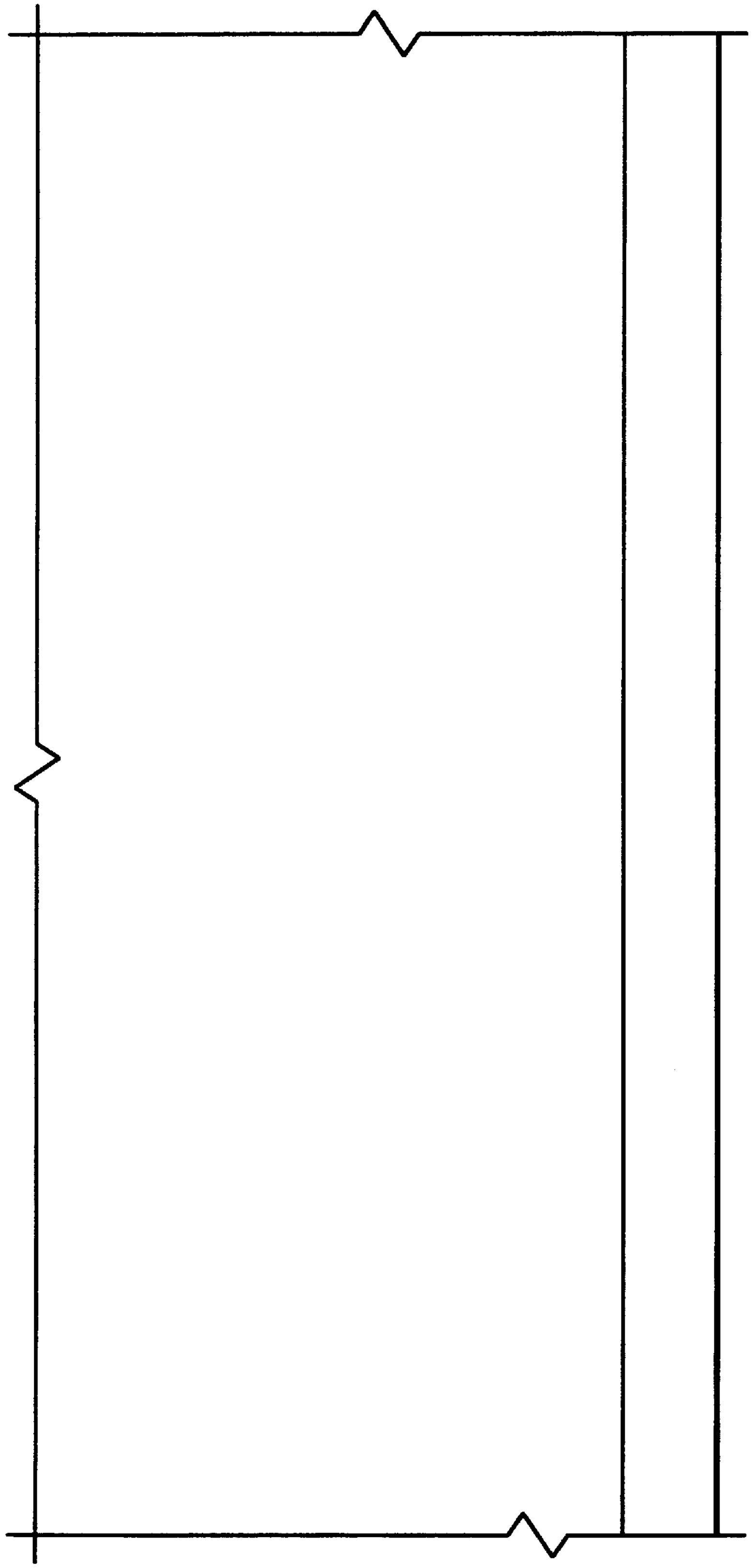
FIG 9.02BK

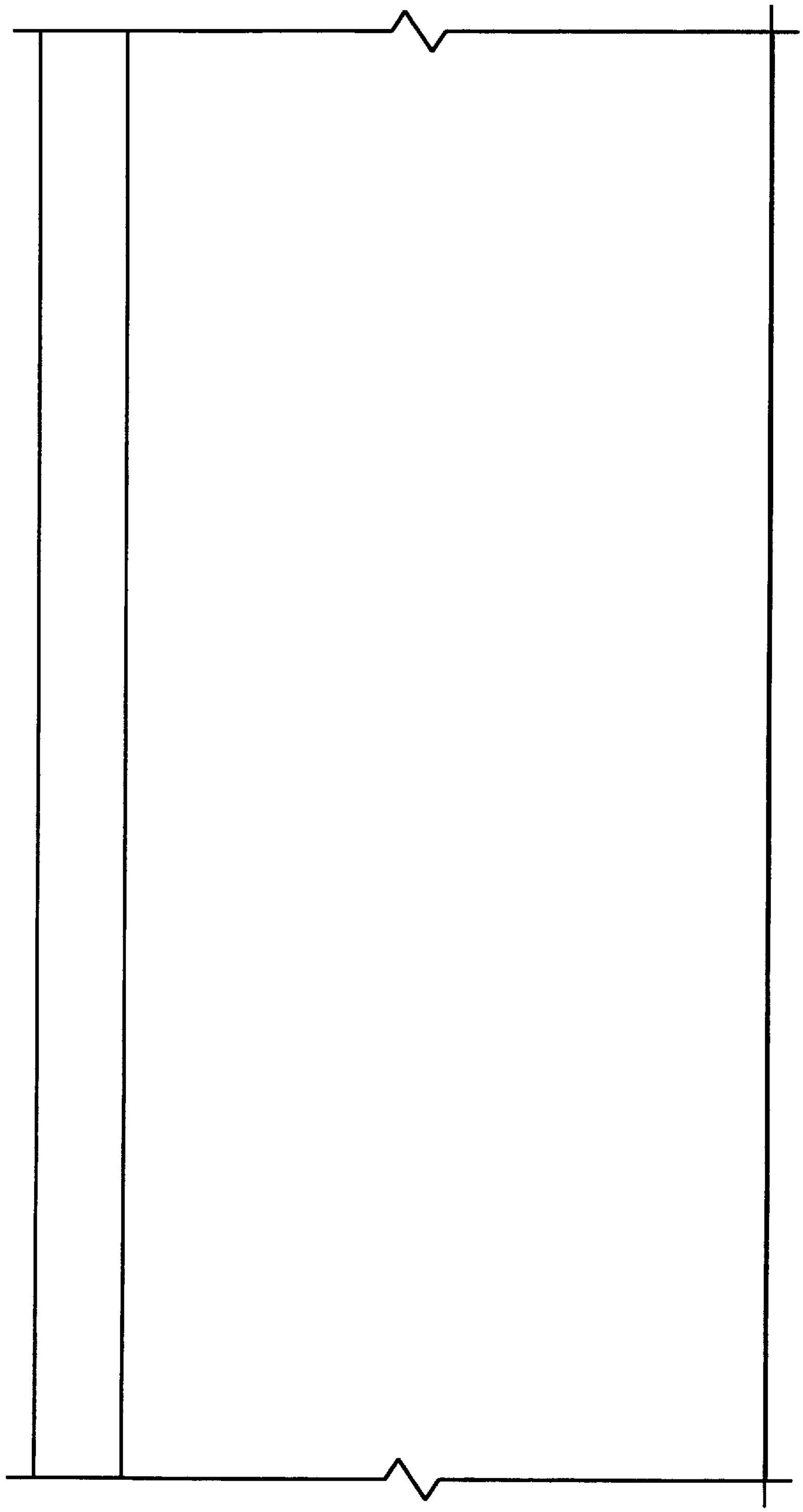
Fig 9.02CA

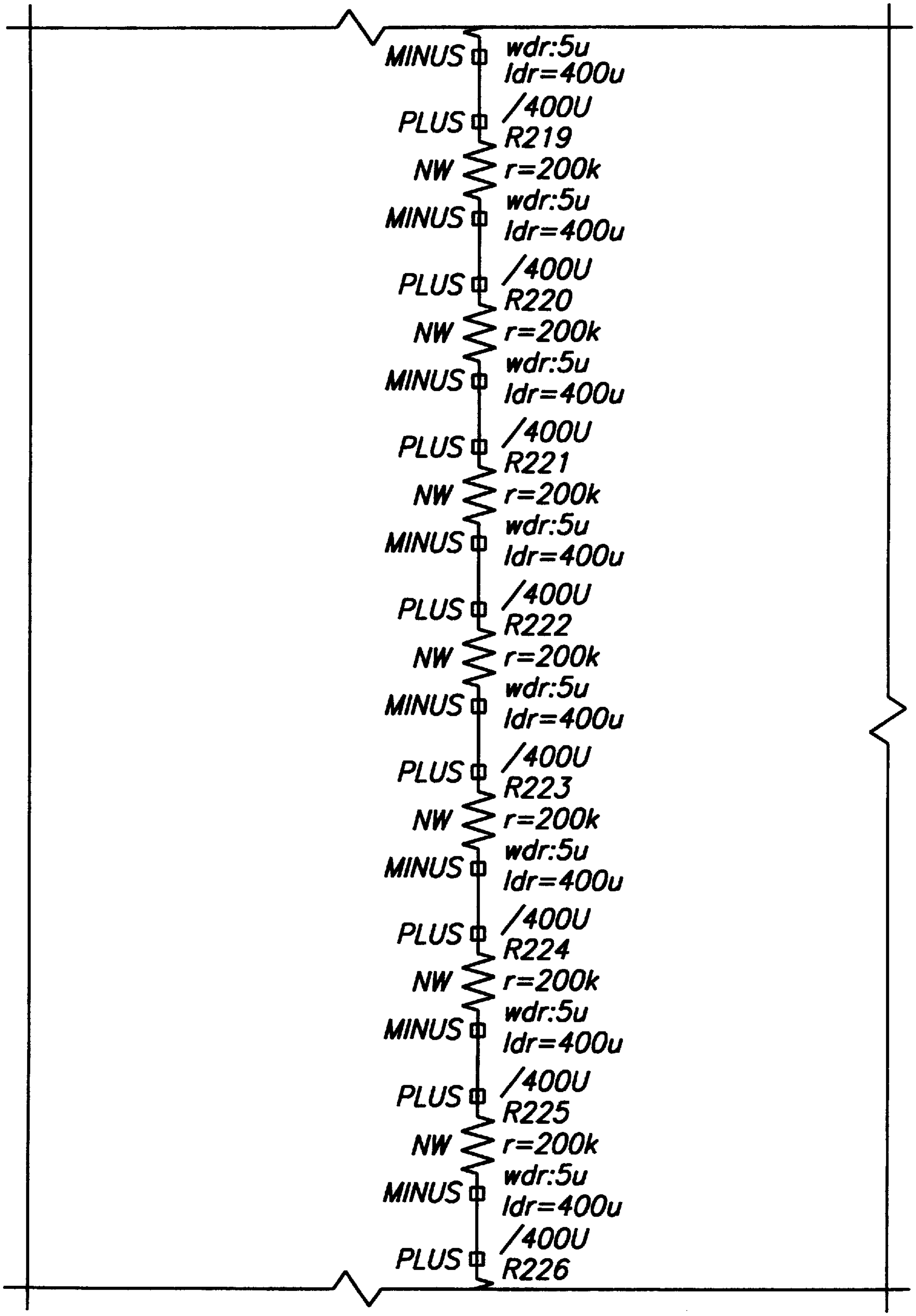
Fig 9.02CC

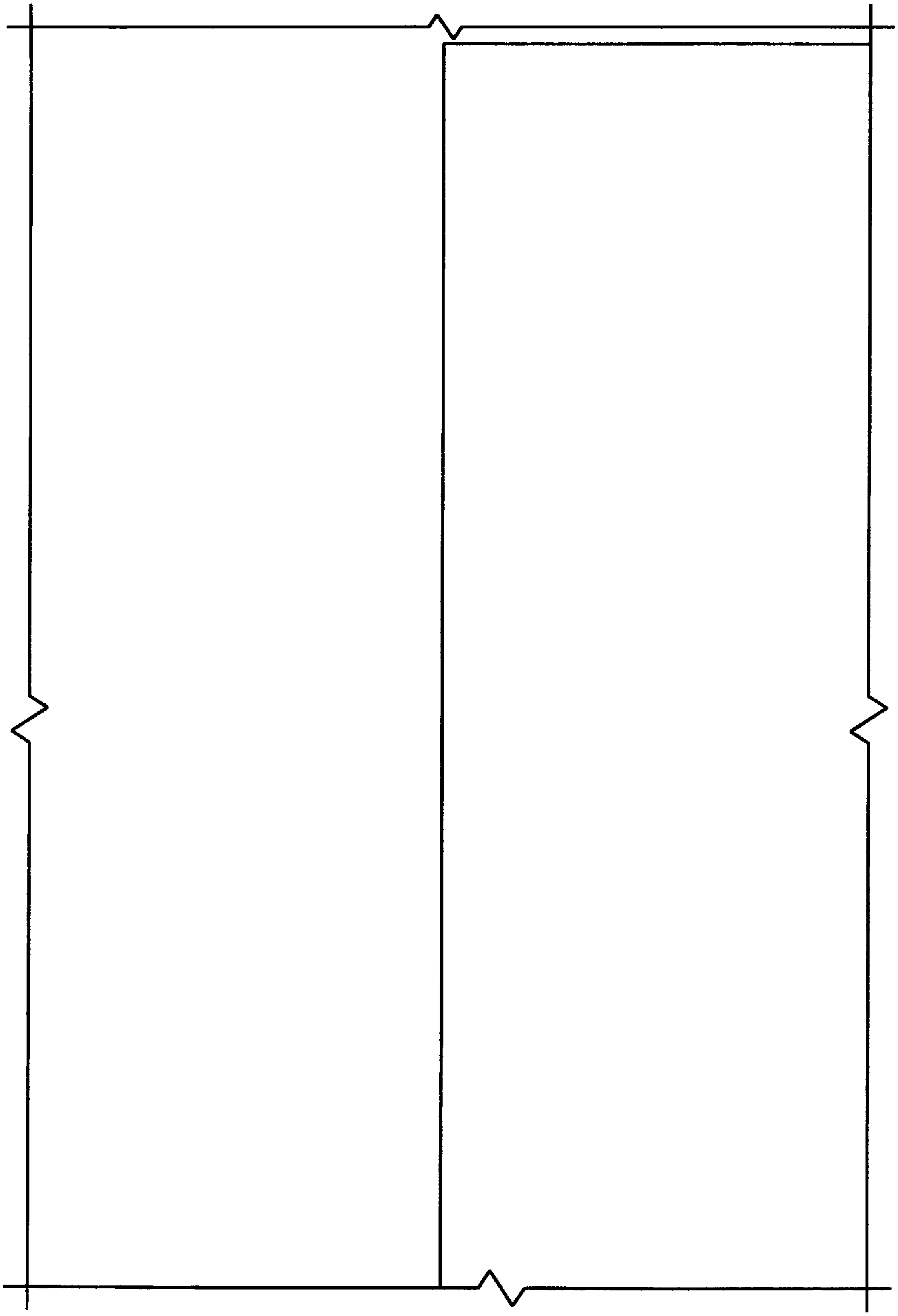
FIG. 9.02CD

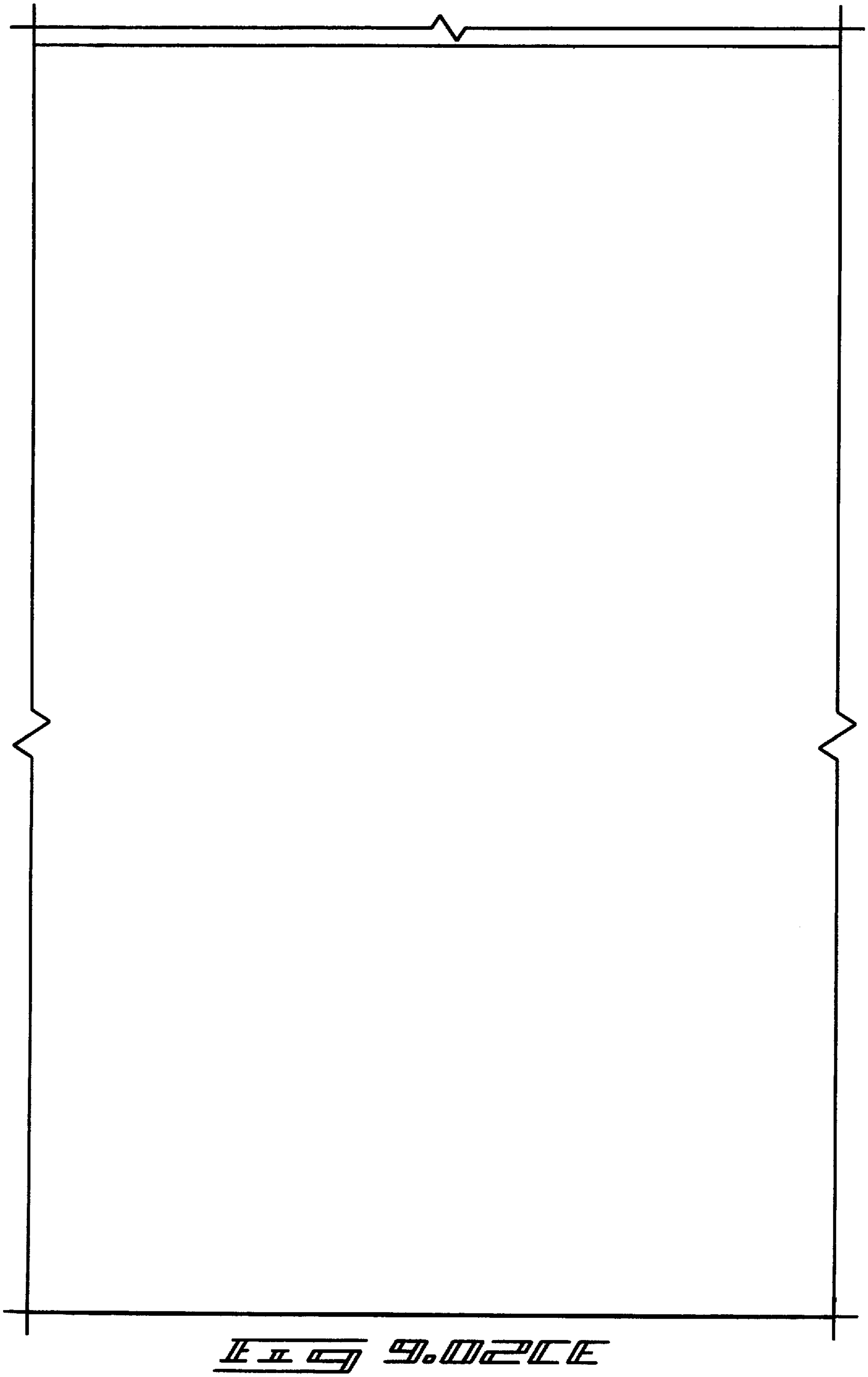
Fig 9.02CE

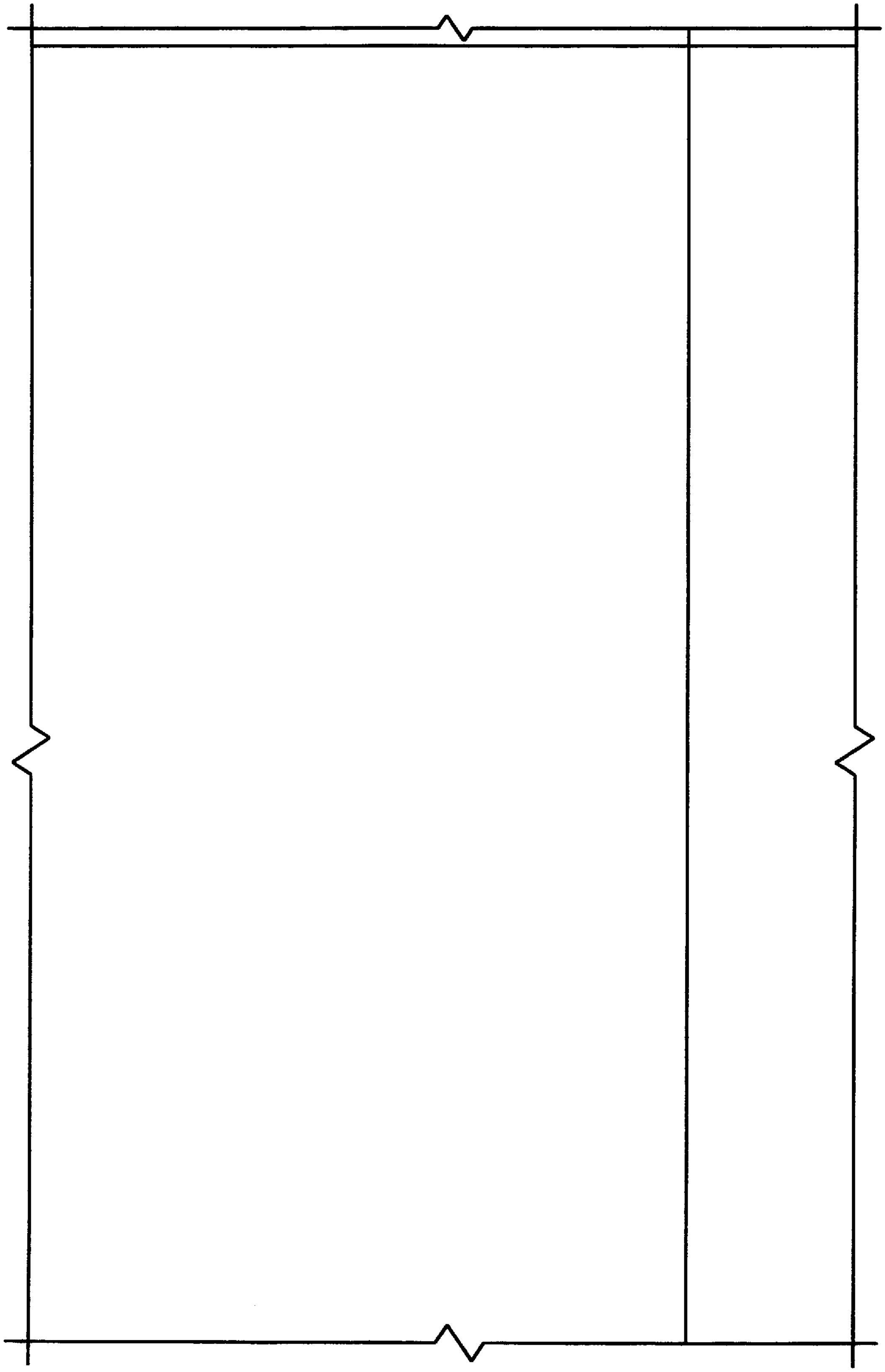
FIG. 9.02CF

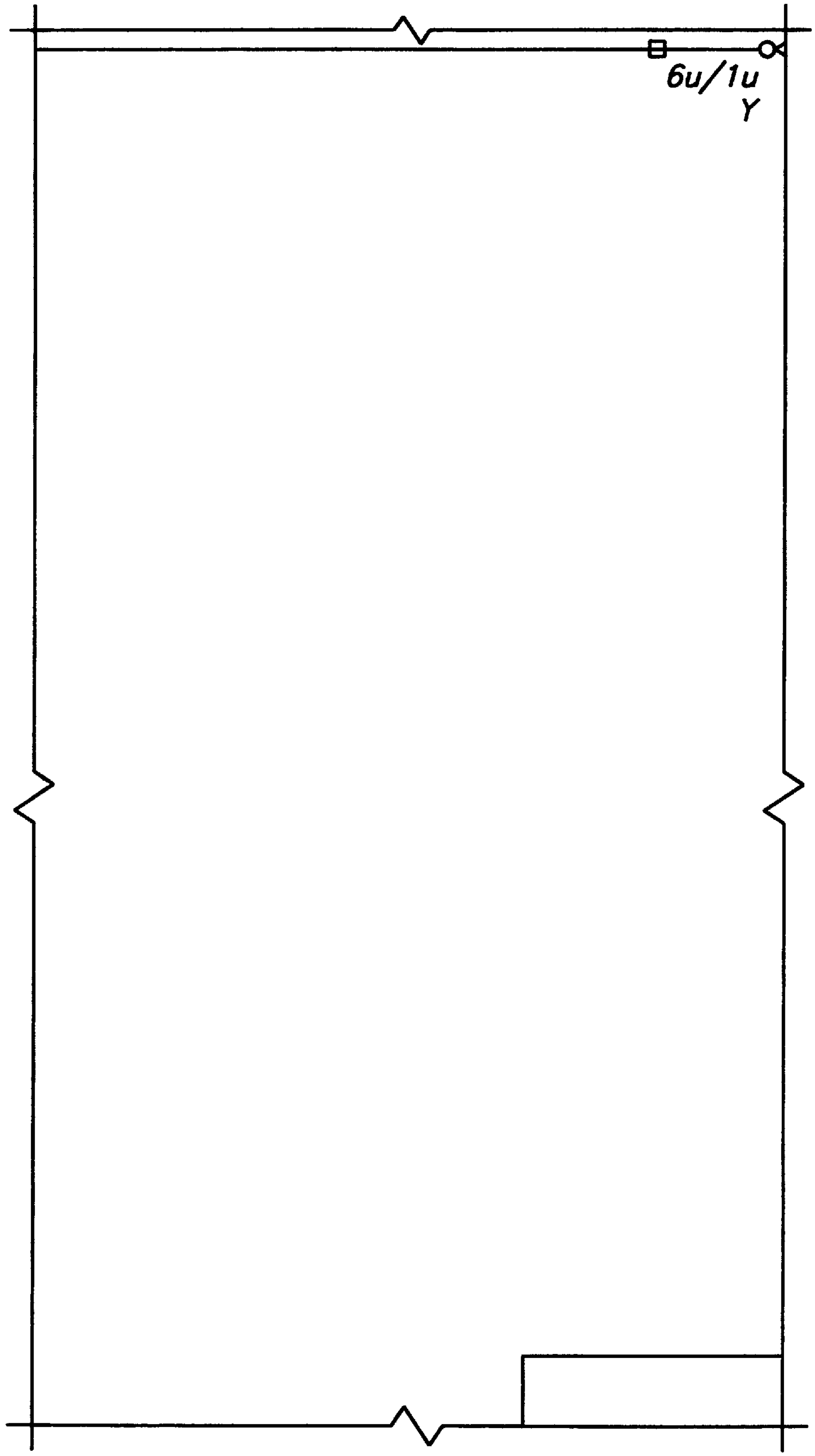
Fig 9.02CG

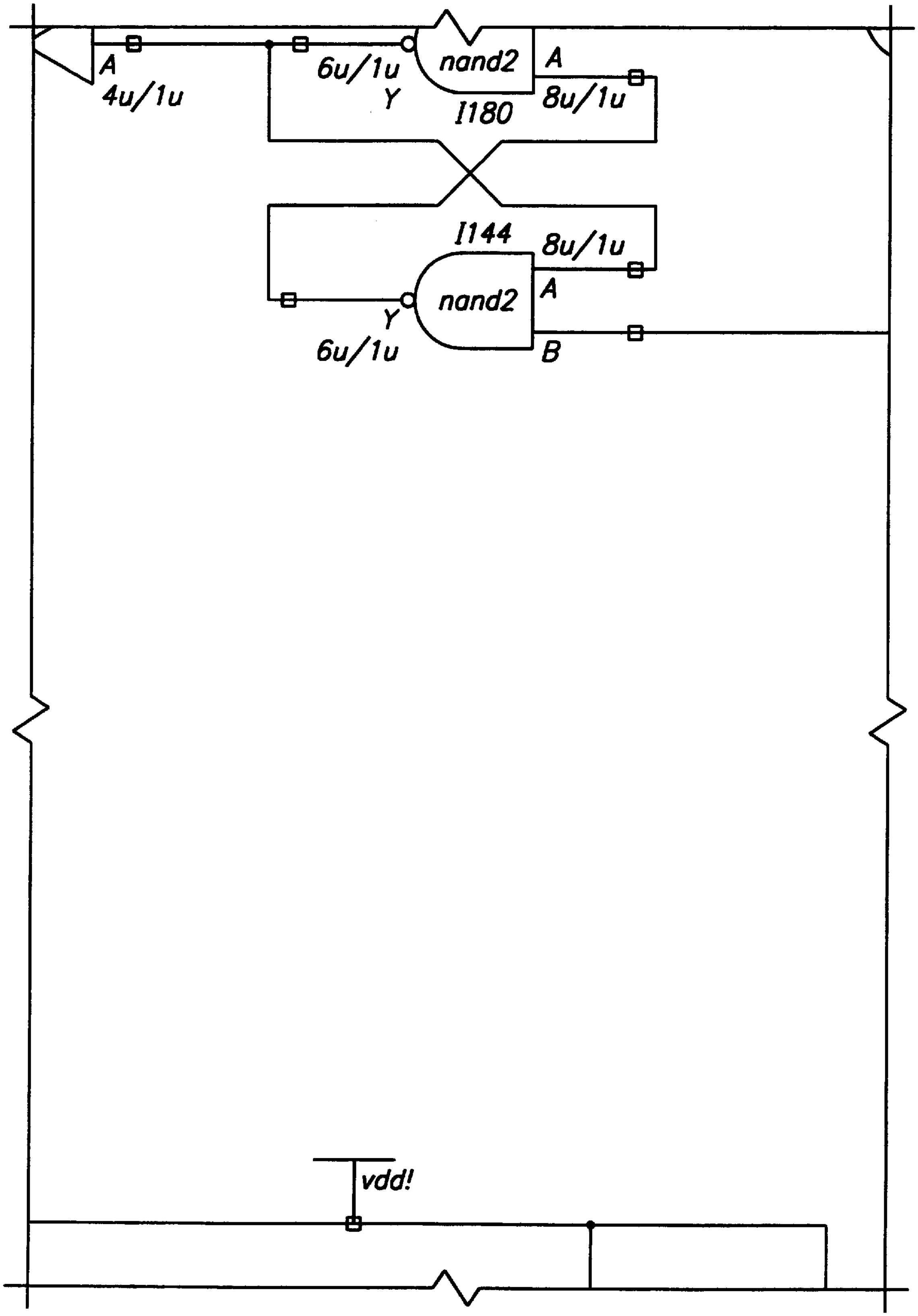
FIG 9.02CH

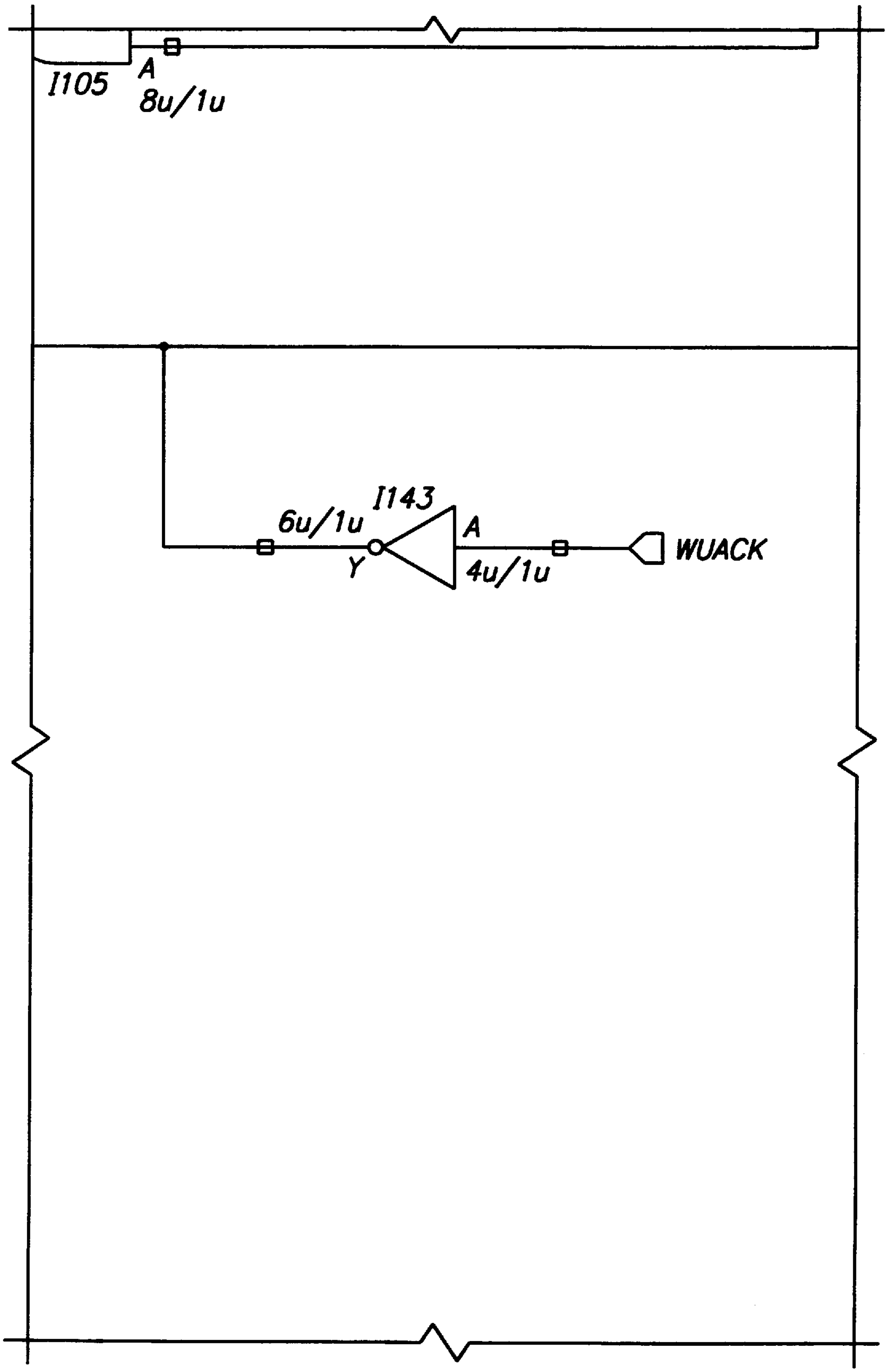
Fig 9.02CI

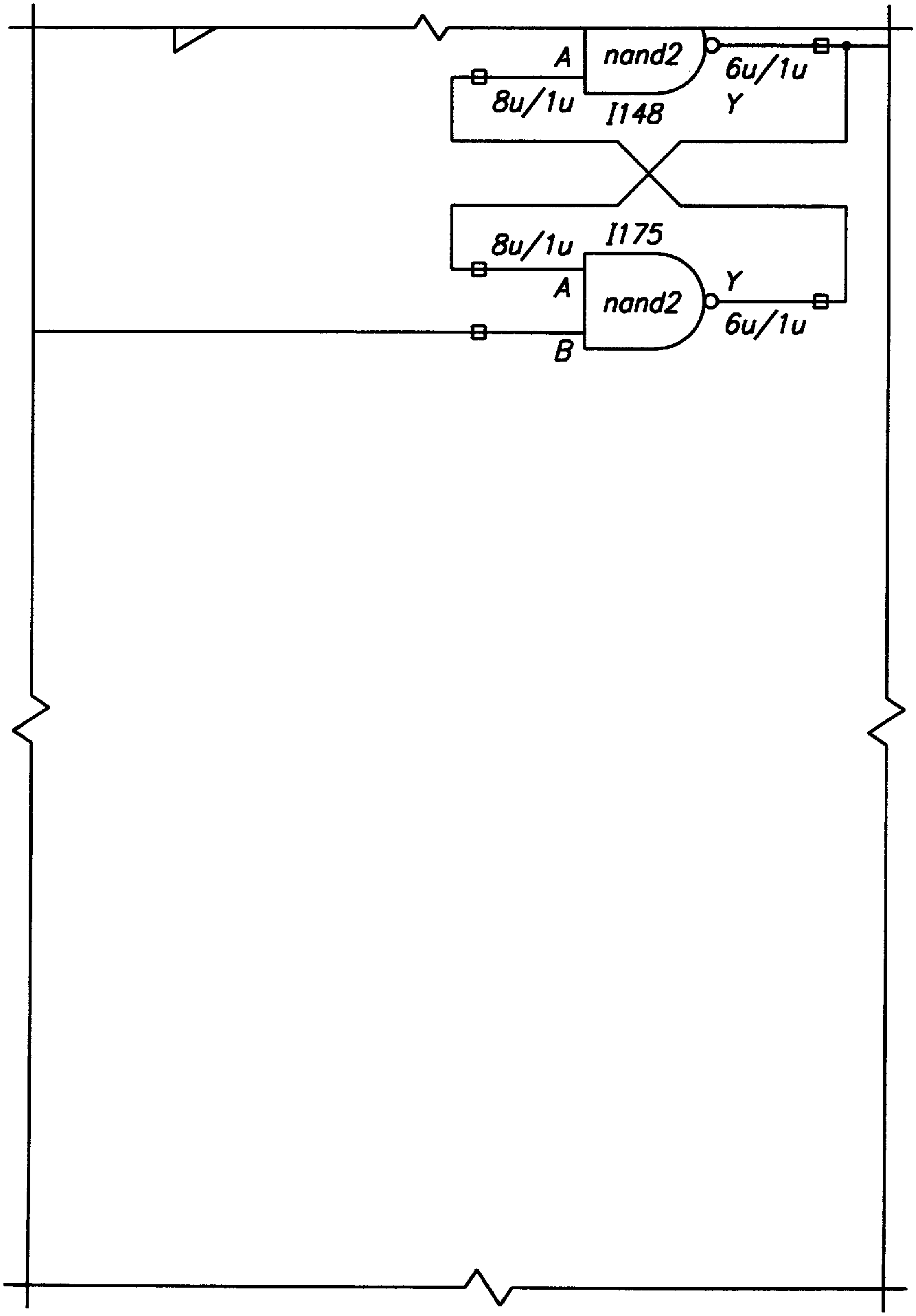
Fig 9.02Cd

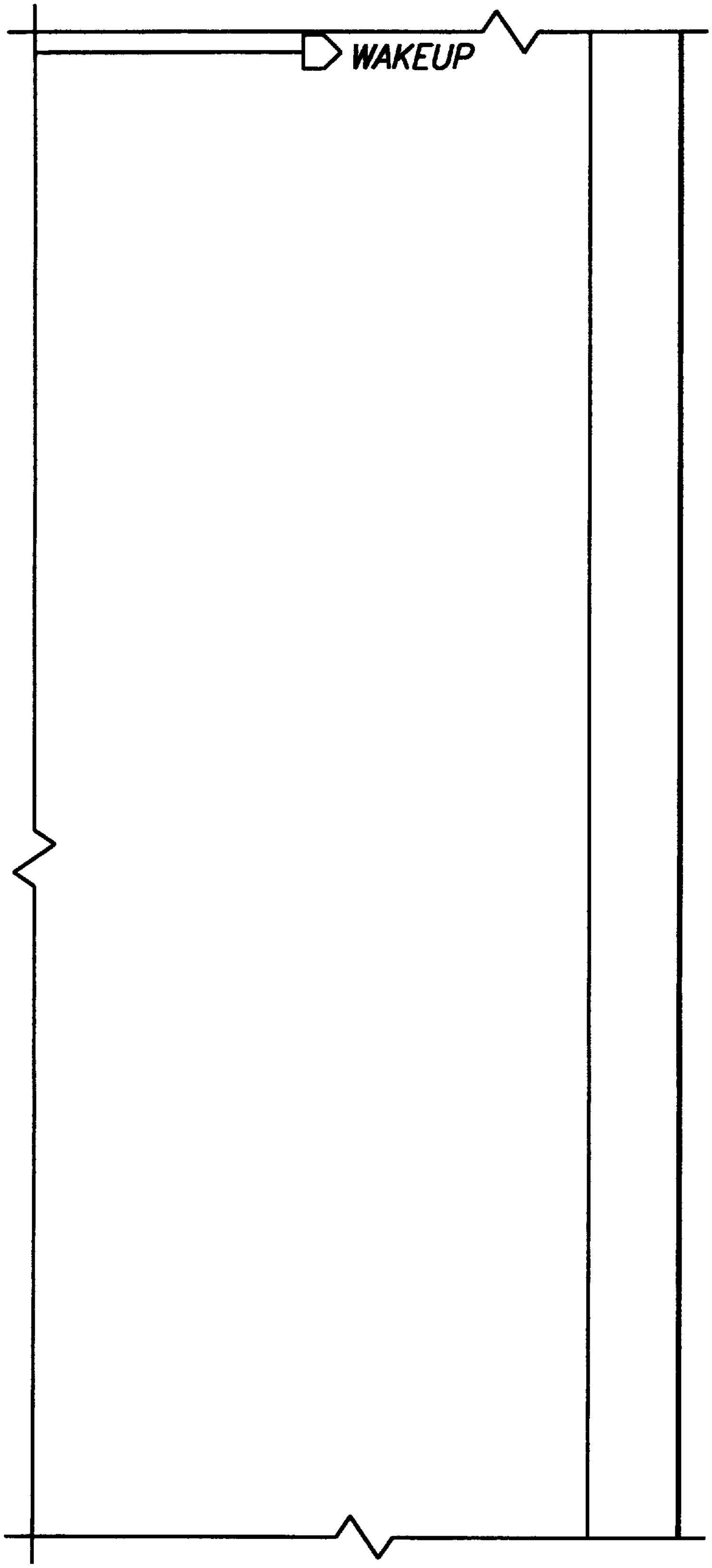
FIG 9.02CK

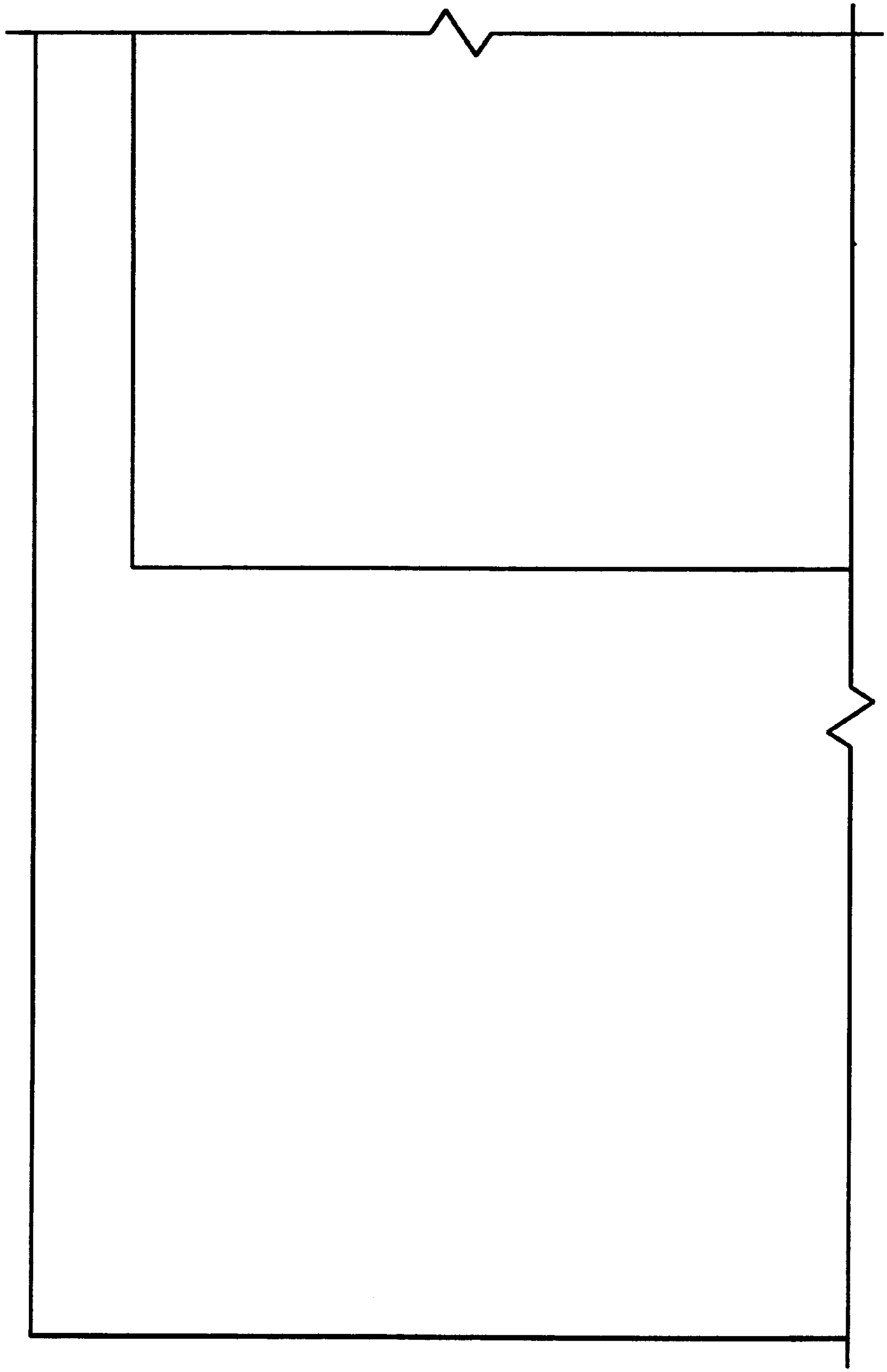
FIG. 9.02DA

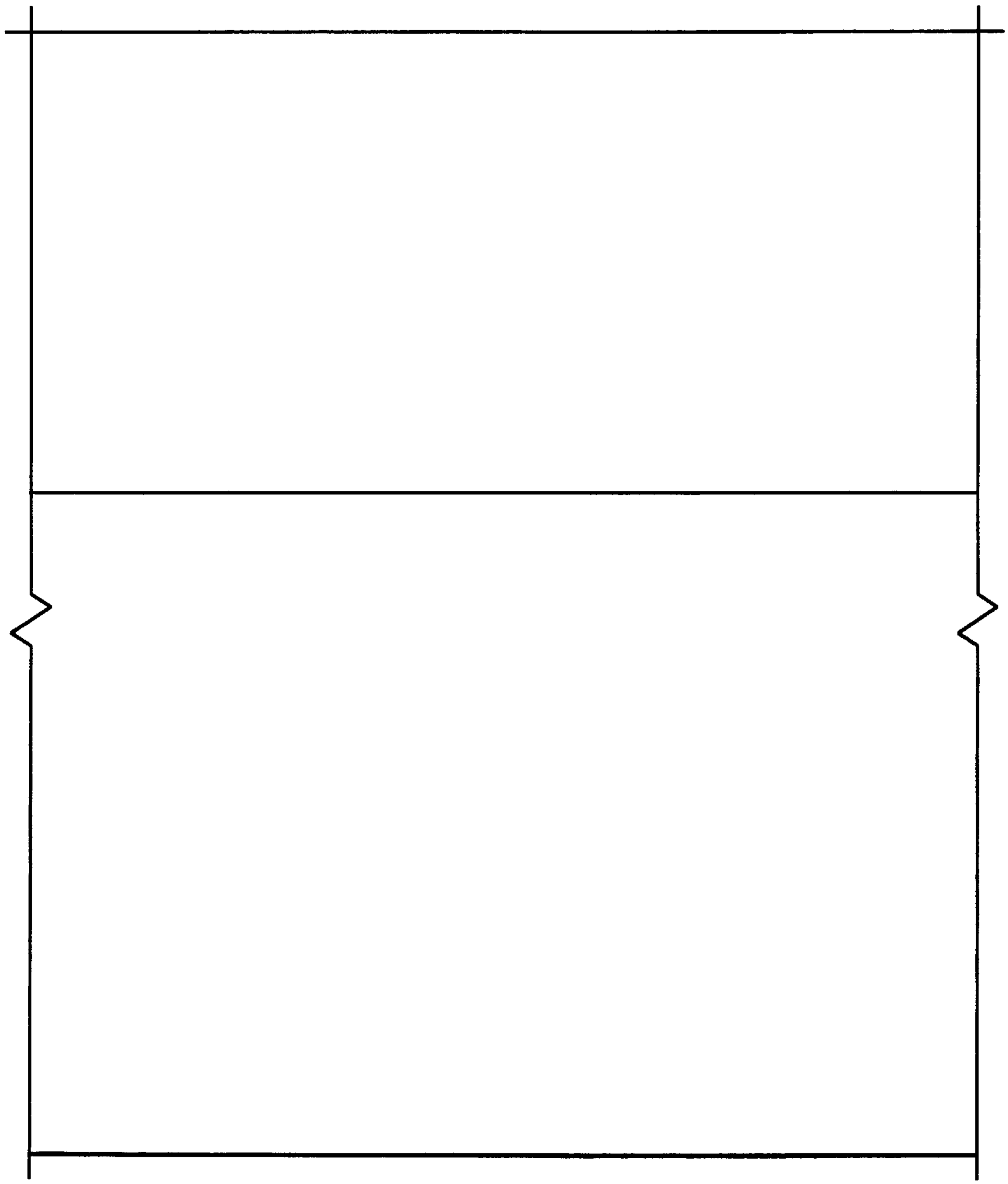
FIG. 9.02DB

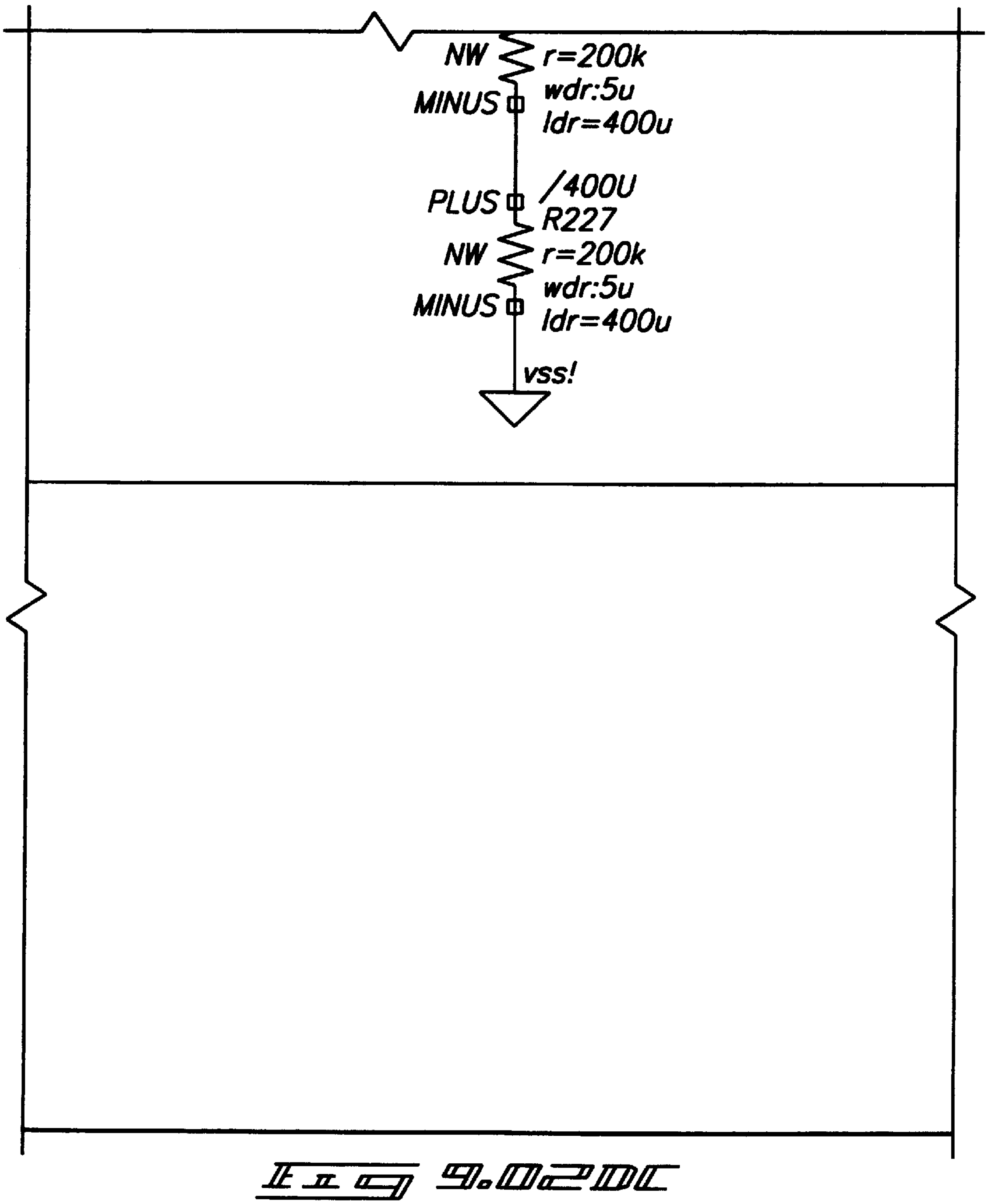
Fig 9.02DC

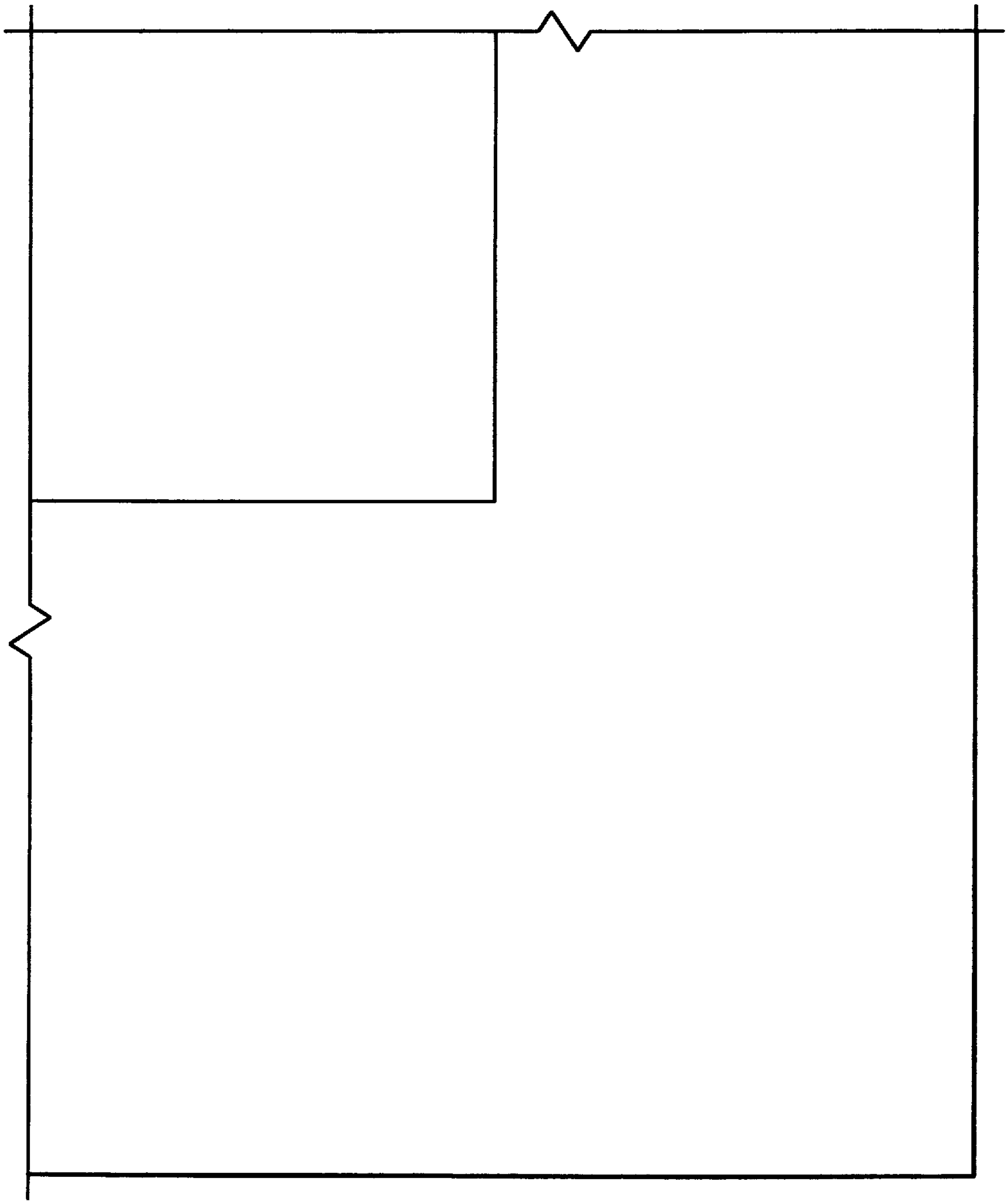
FIG. 9.02DD

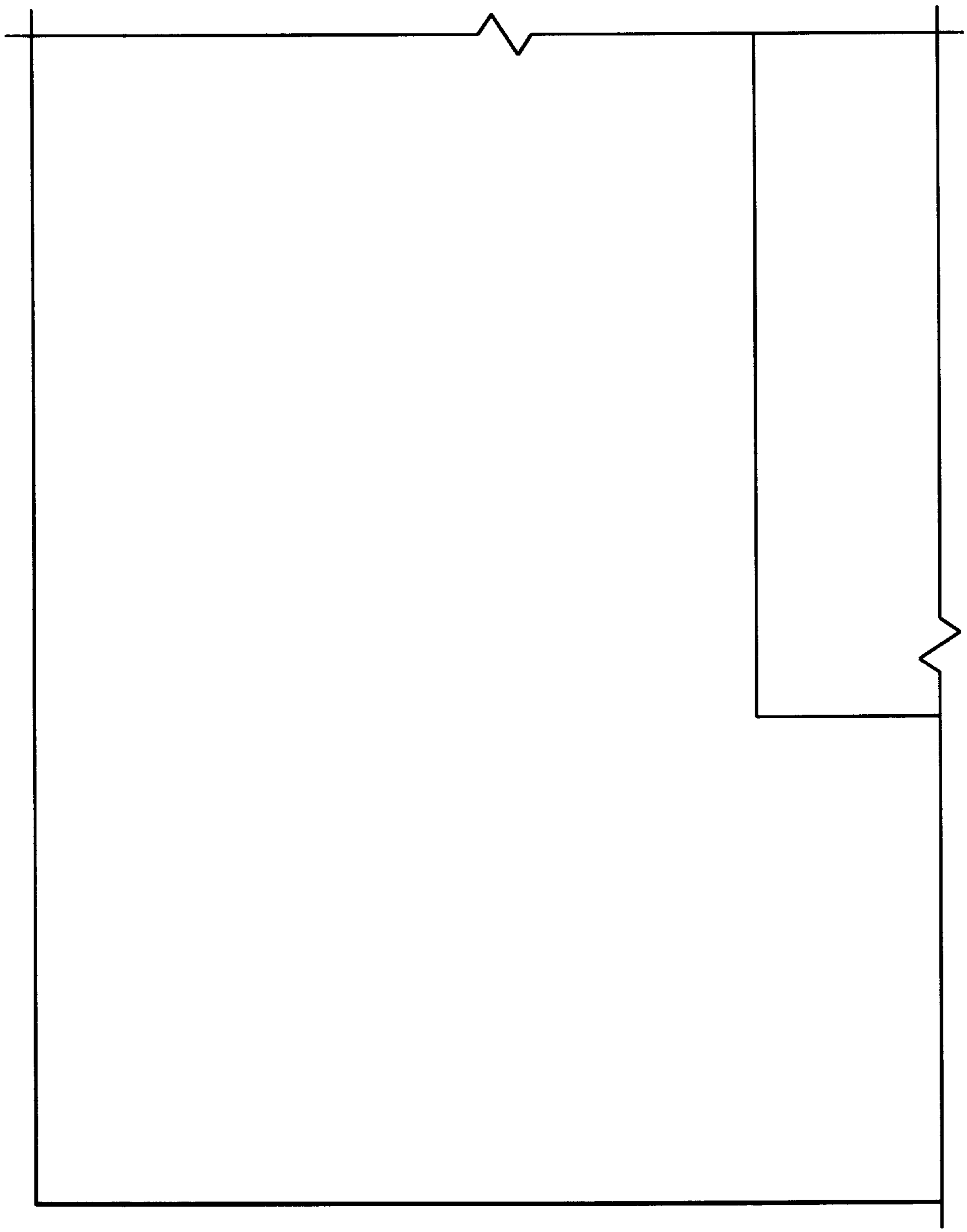
Fig 9.02DF

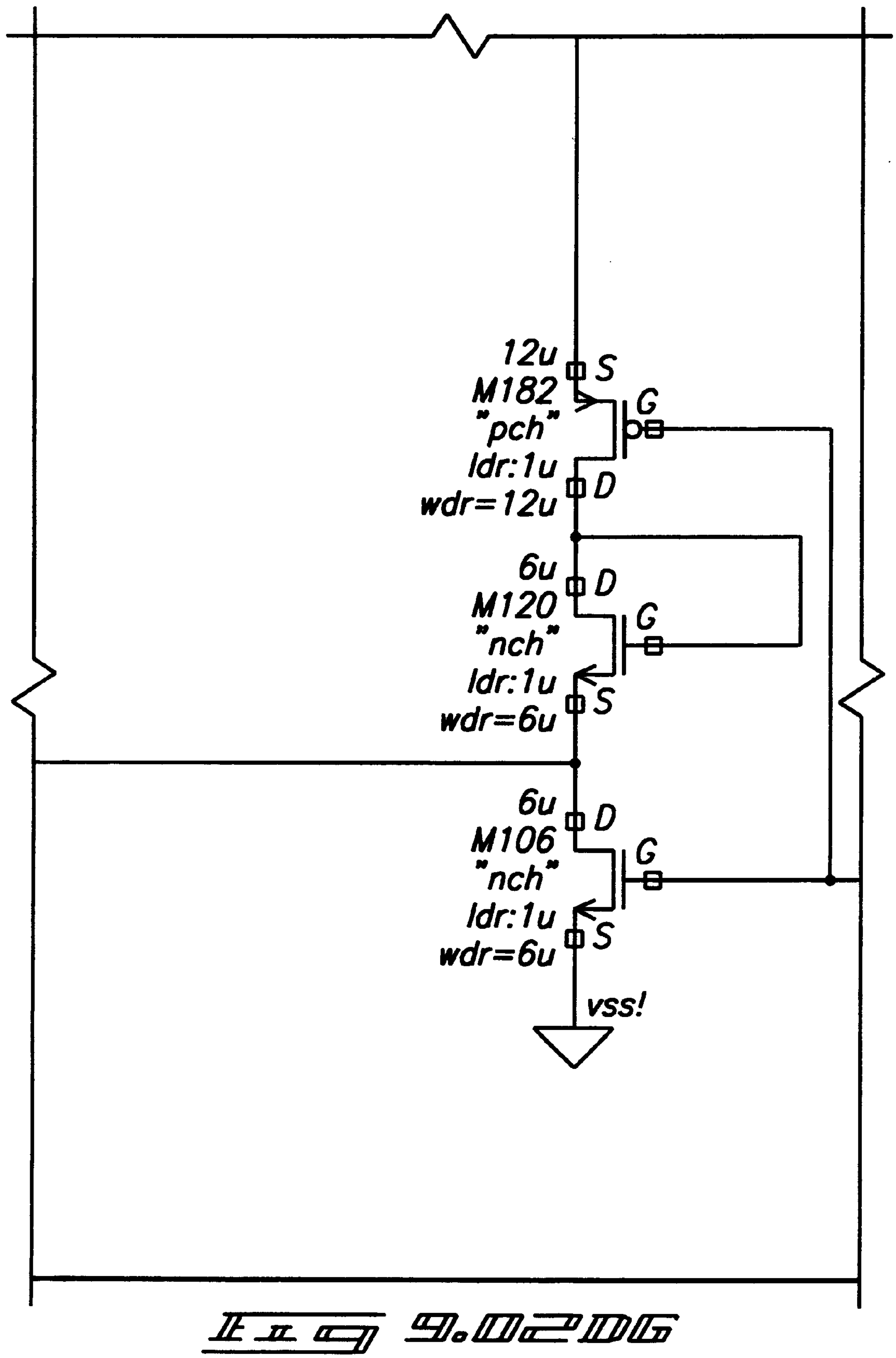
Fig 9.02DG

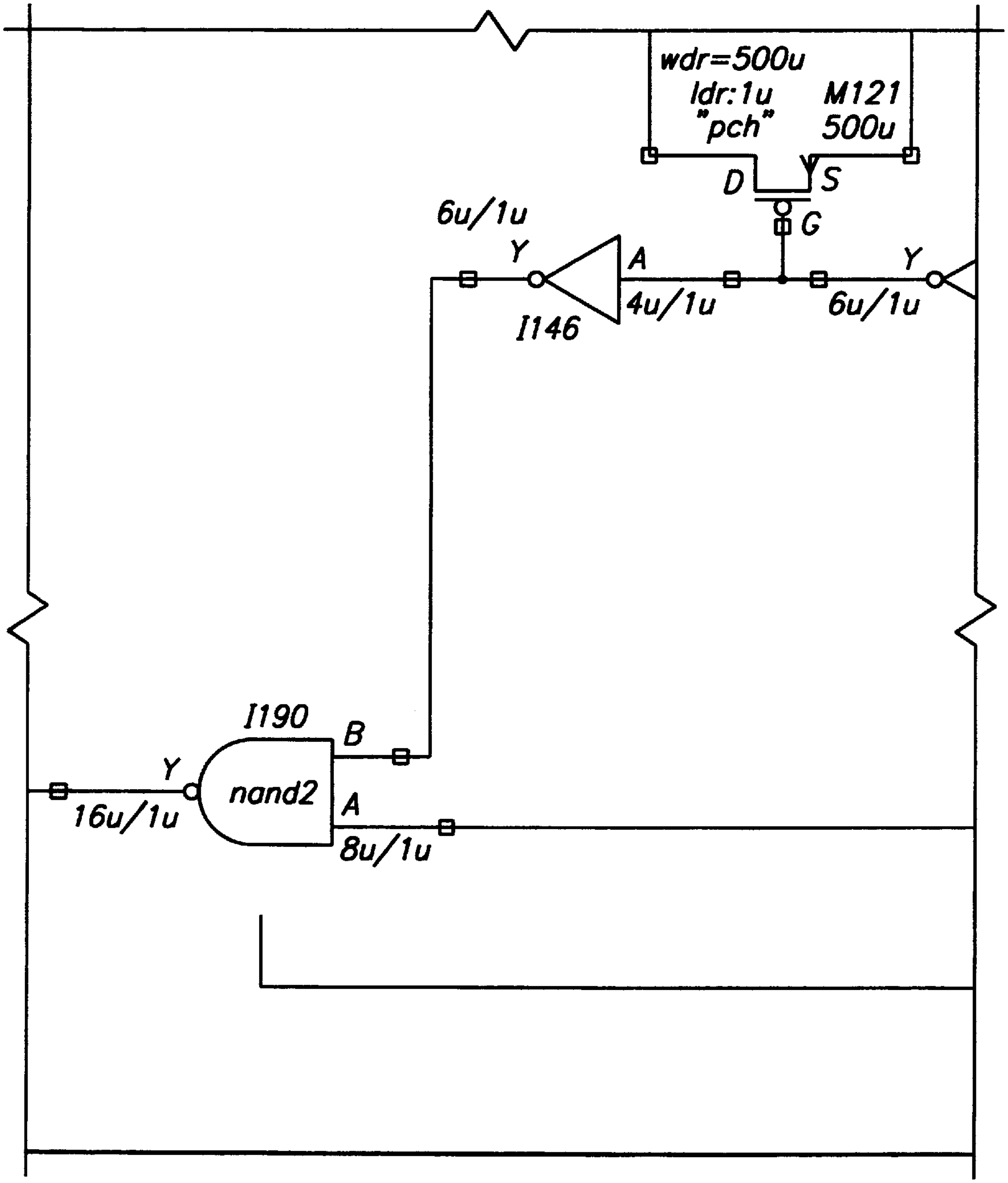
Fig 9.02DH

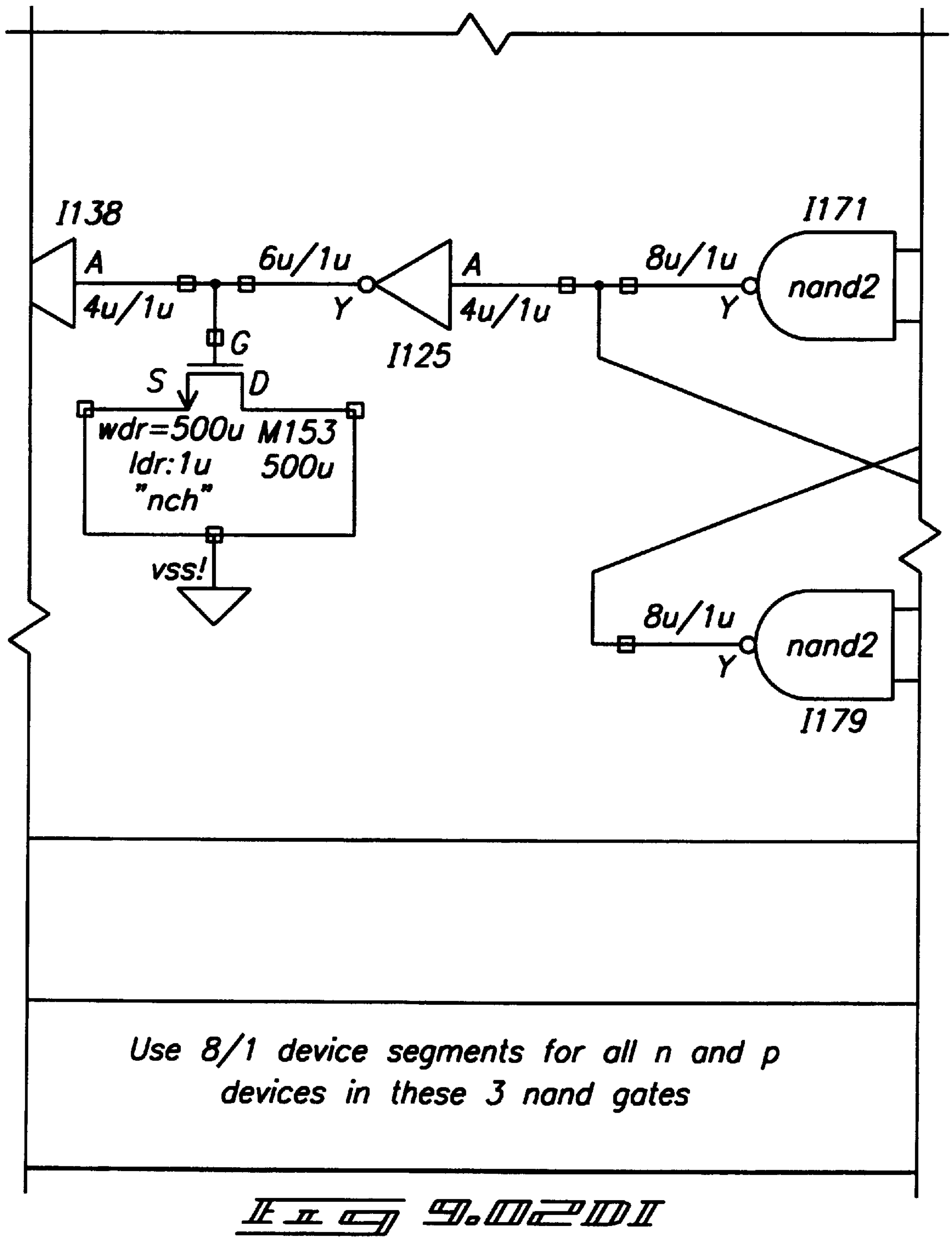
Fig 9.02DI

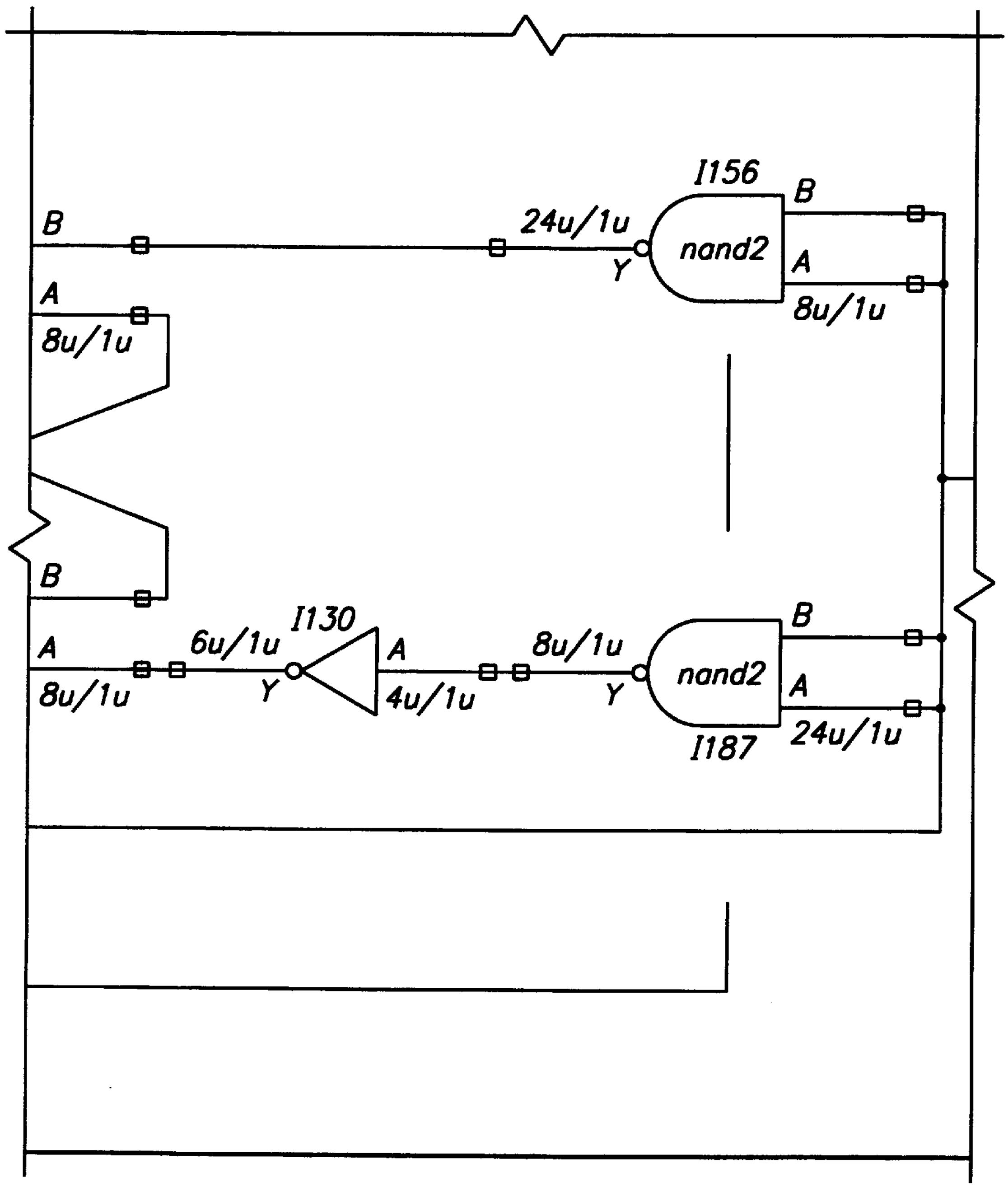
FIG 9.02Da1

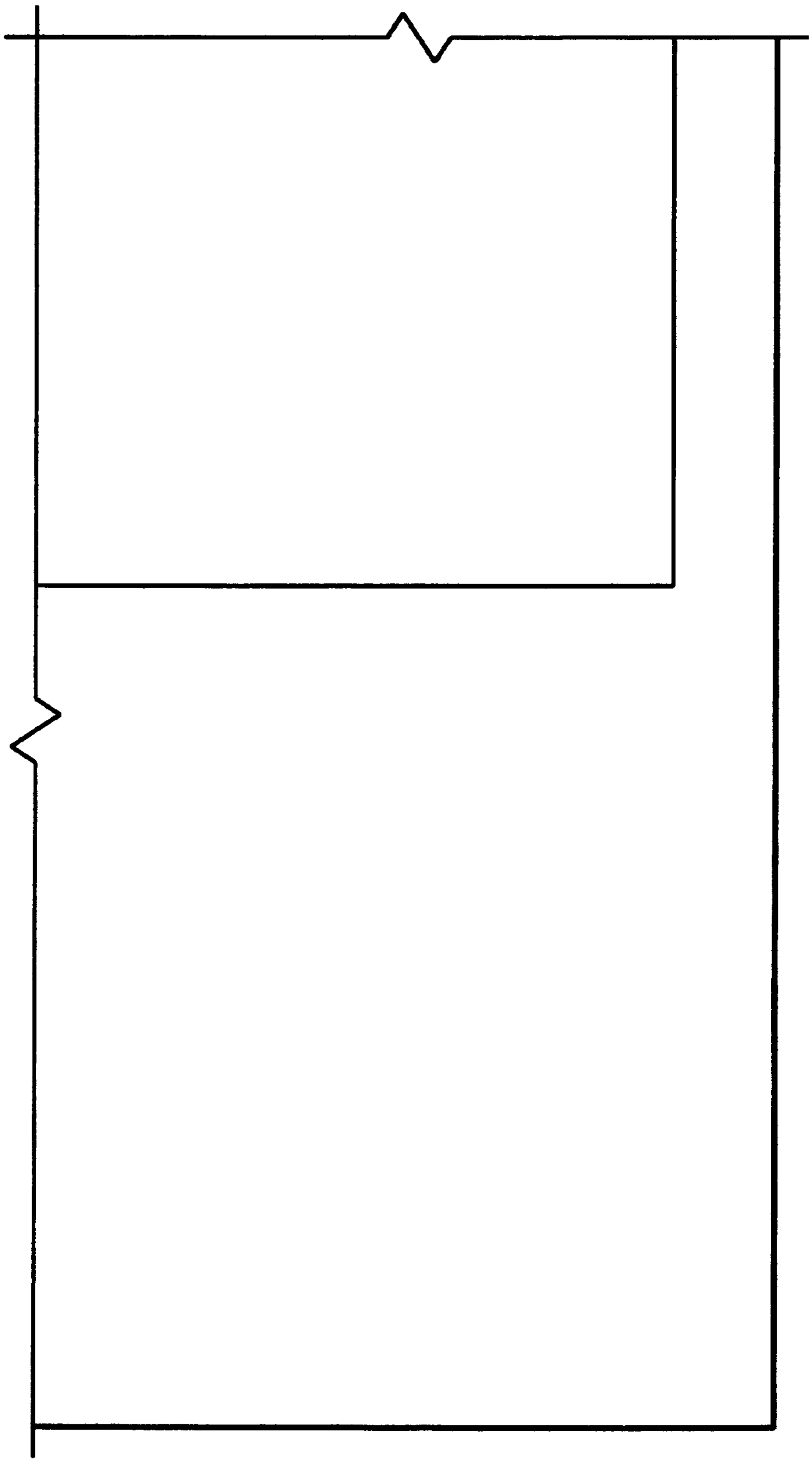
Fig 9.02DK

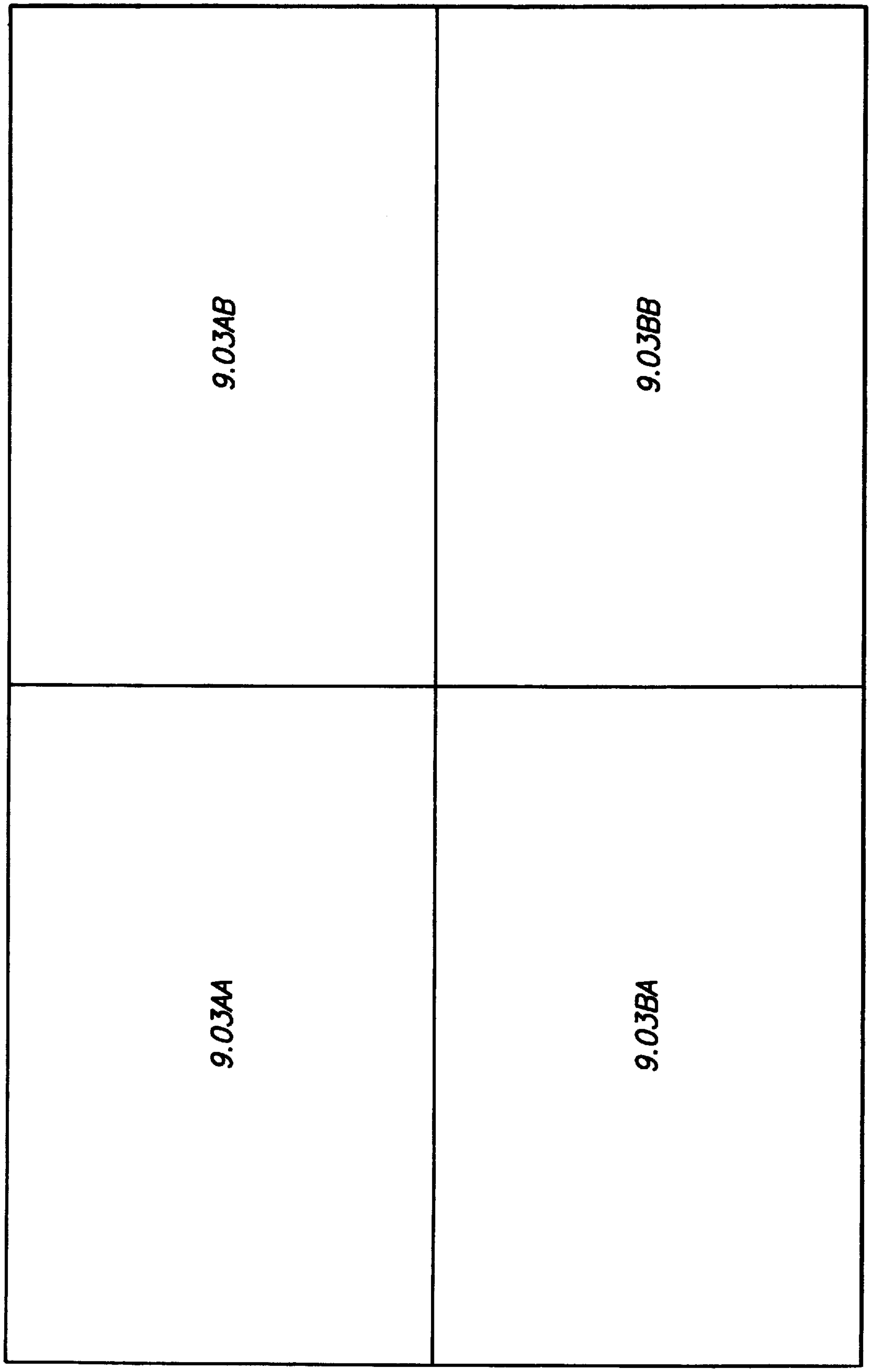
FIG. 9.03

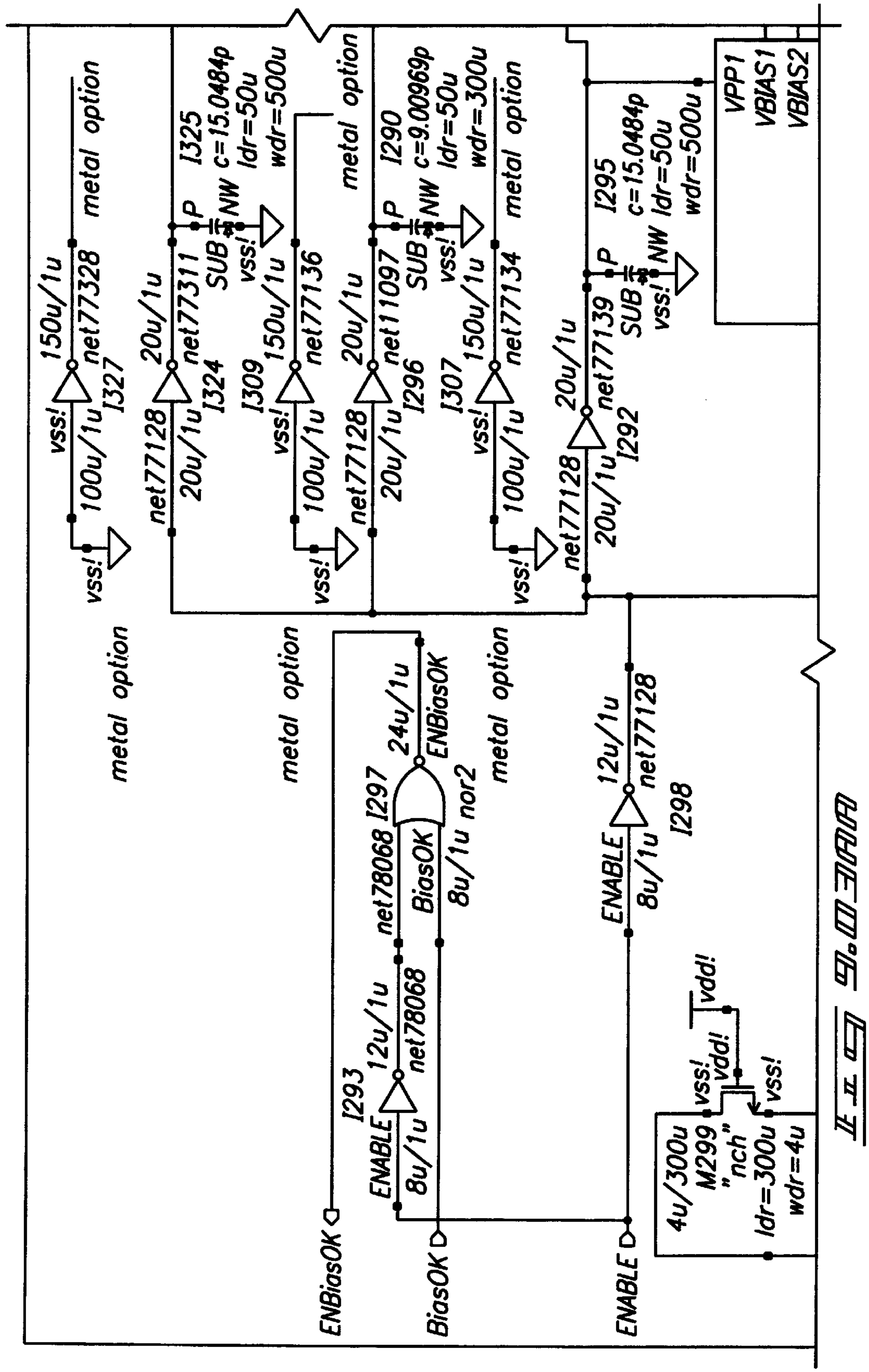
FIG. 9.00AA

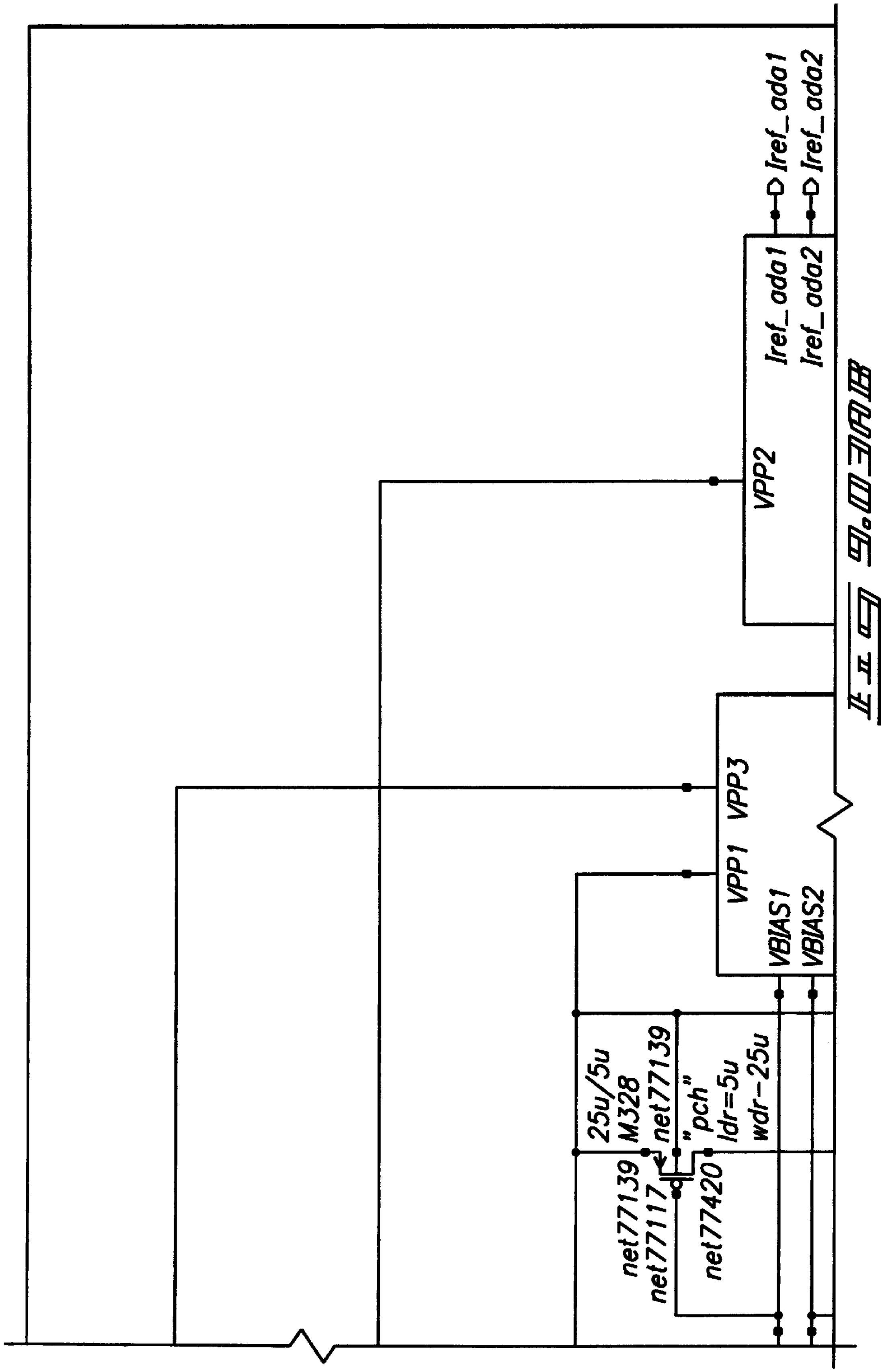
Fig. 9.0EAB

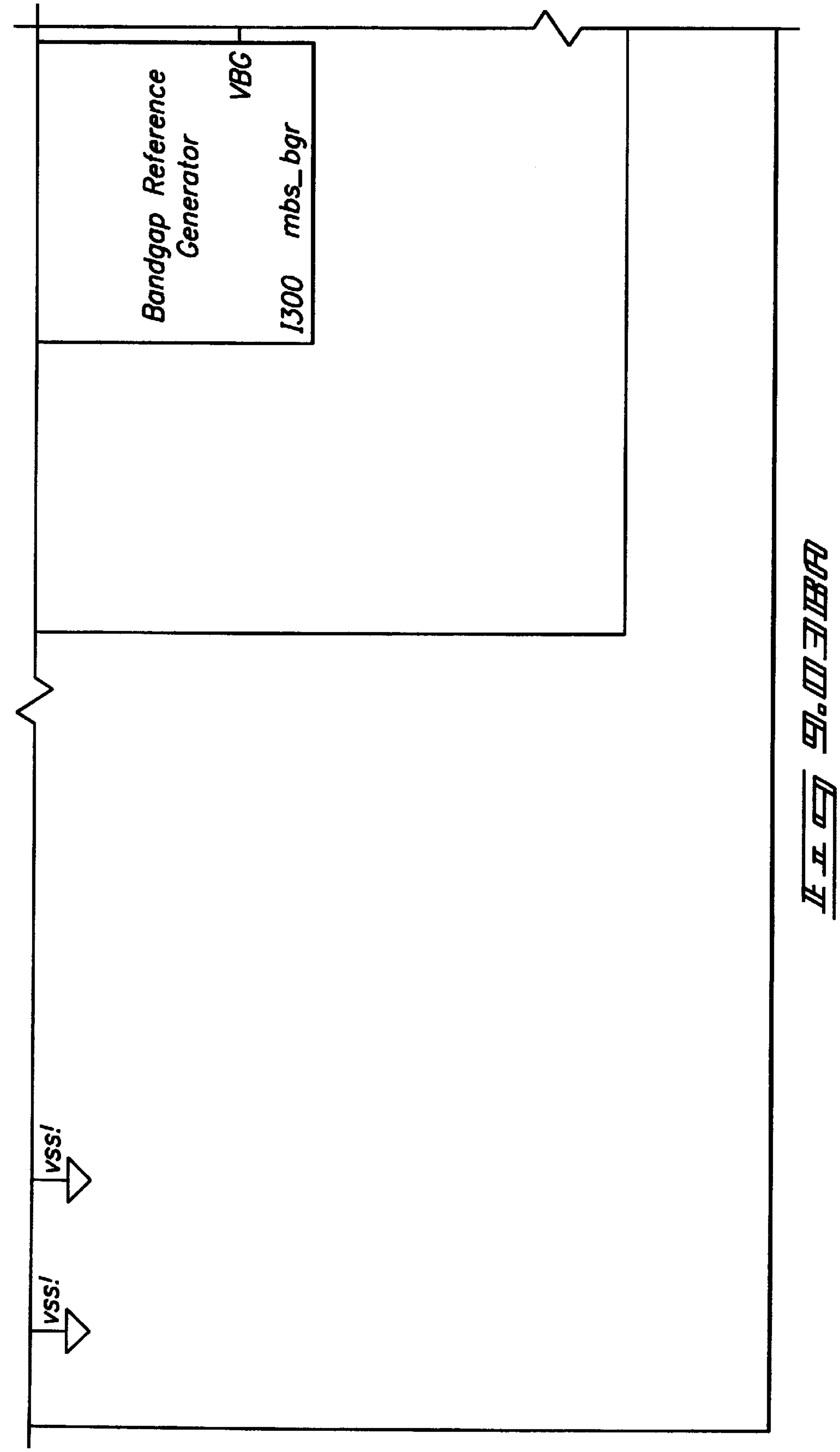
FIG. 9.03BB

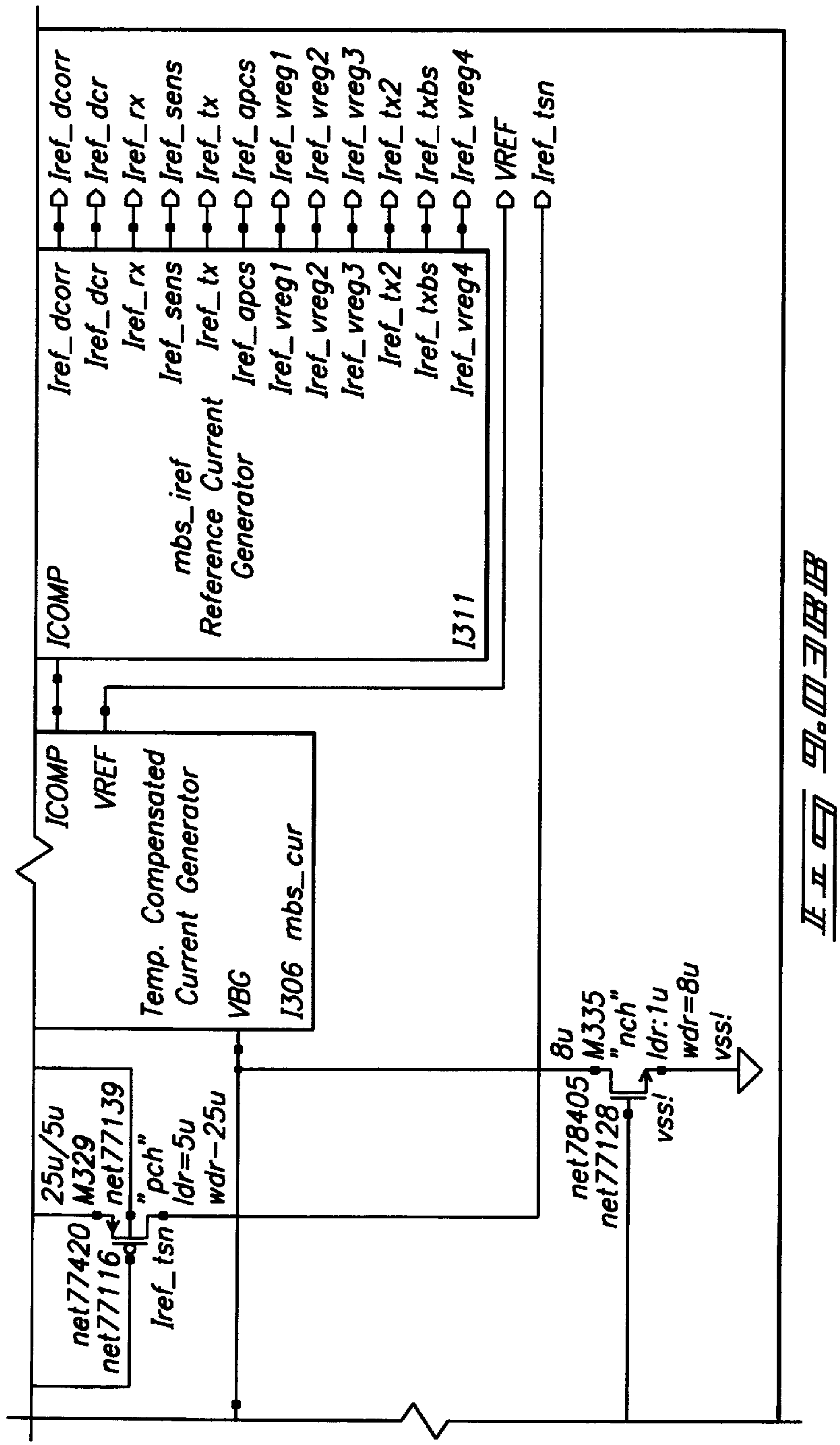
Fig. 9.03BB

| | | | | | | | | | |
|---|---|---|---|---|---|---|---|---|---|
| 9.0301AA | 9.0301AB | 9.0301AC | 9.0301AD | 9.0301AE | 9.0301AF | 9.0301AG | 9.0301AH | 9.0301AI | 9.0301AJ |
| 9.0301BA | 9.0301BB | 9.0301BC | 9.0301BD | 9.0301BE | 9.0301BF | 9.0301BG | 9.0301BH | 9.0301BI | 9.0301BJ |
| | 9.0301CB | 9.0301CC | 9.0301CD | 9.0301CE | 9.0301CF | 9.0301CG | 9.0301CH | 9.0301CI | 9.0301CJ |
| 9.0301DA | 9.0301DB | 9.0301DC | 9.0301DD | 9.0301DE | 9.0301DF | 9.0301DG | 9.0301DH | 9.0301DI | 9.0301DJ |

Fig 9.0301

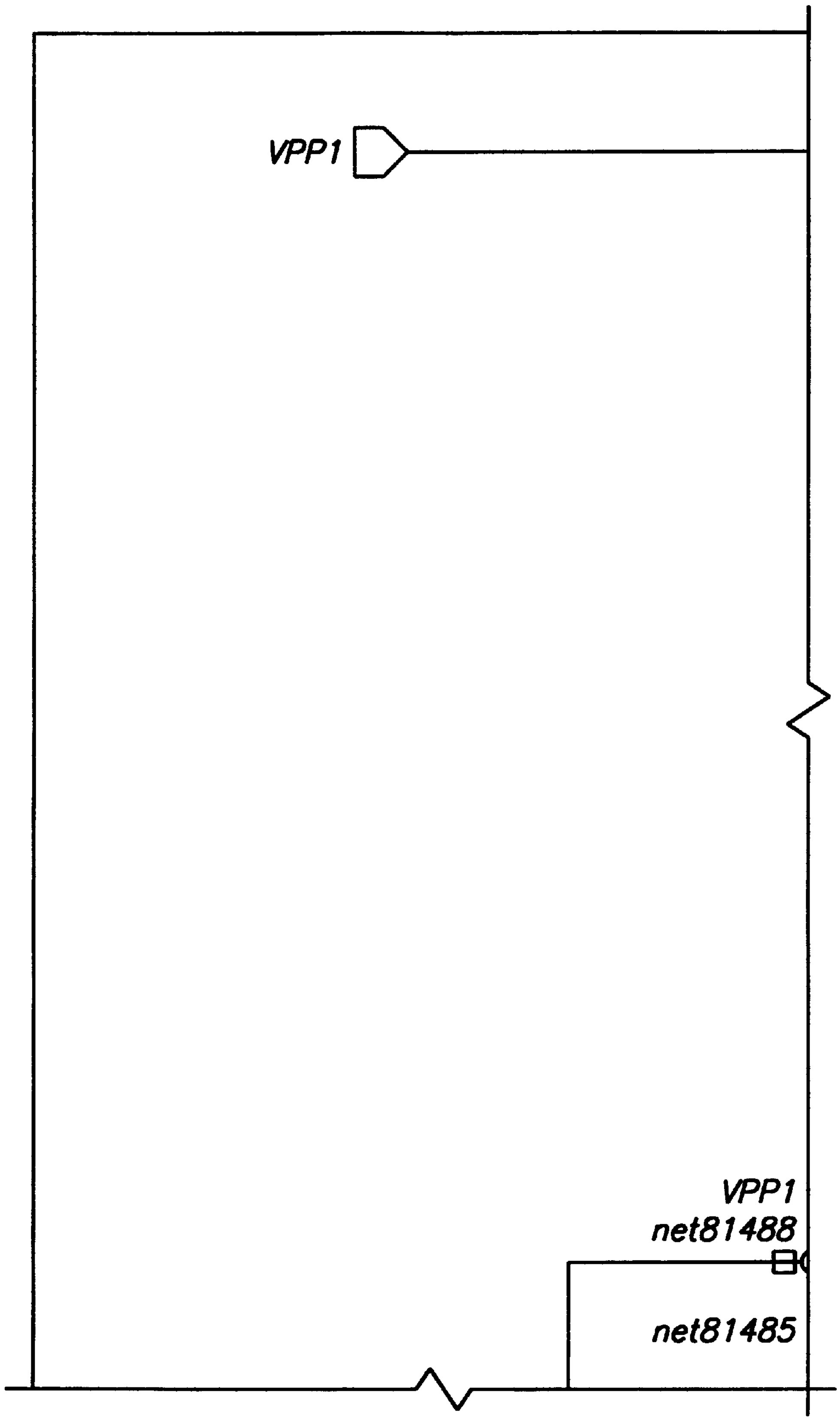
Fig 9.0301AA

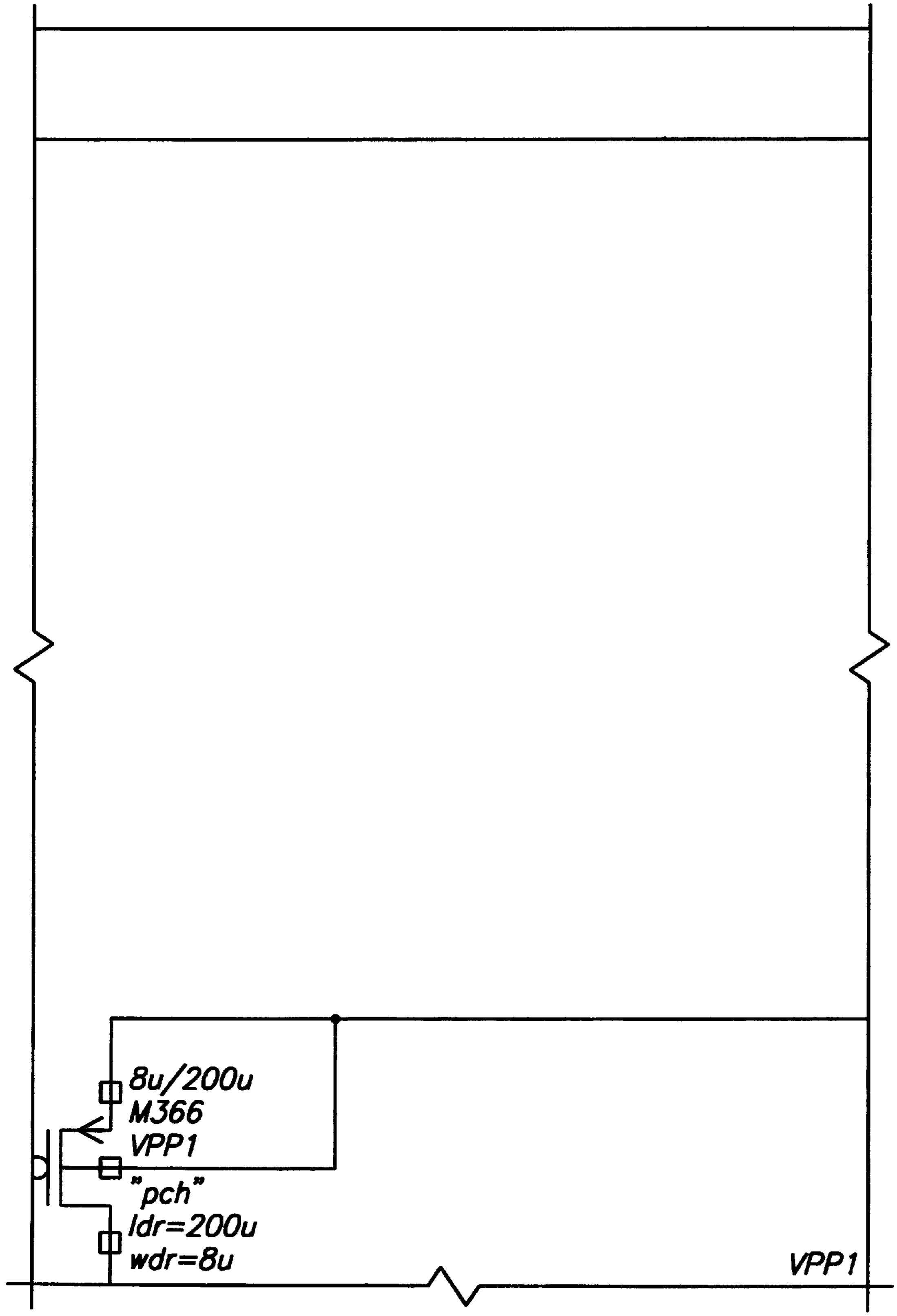
Fig 9.0301AB

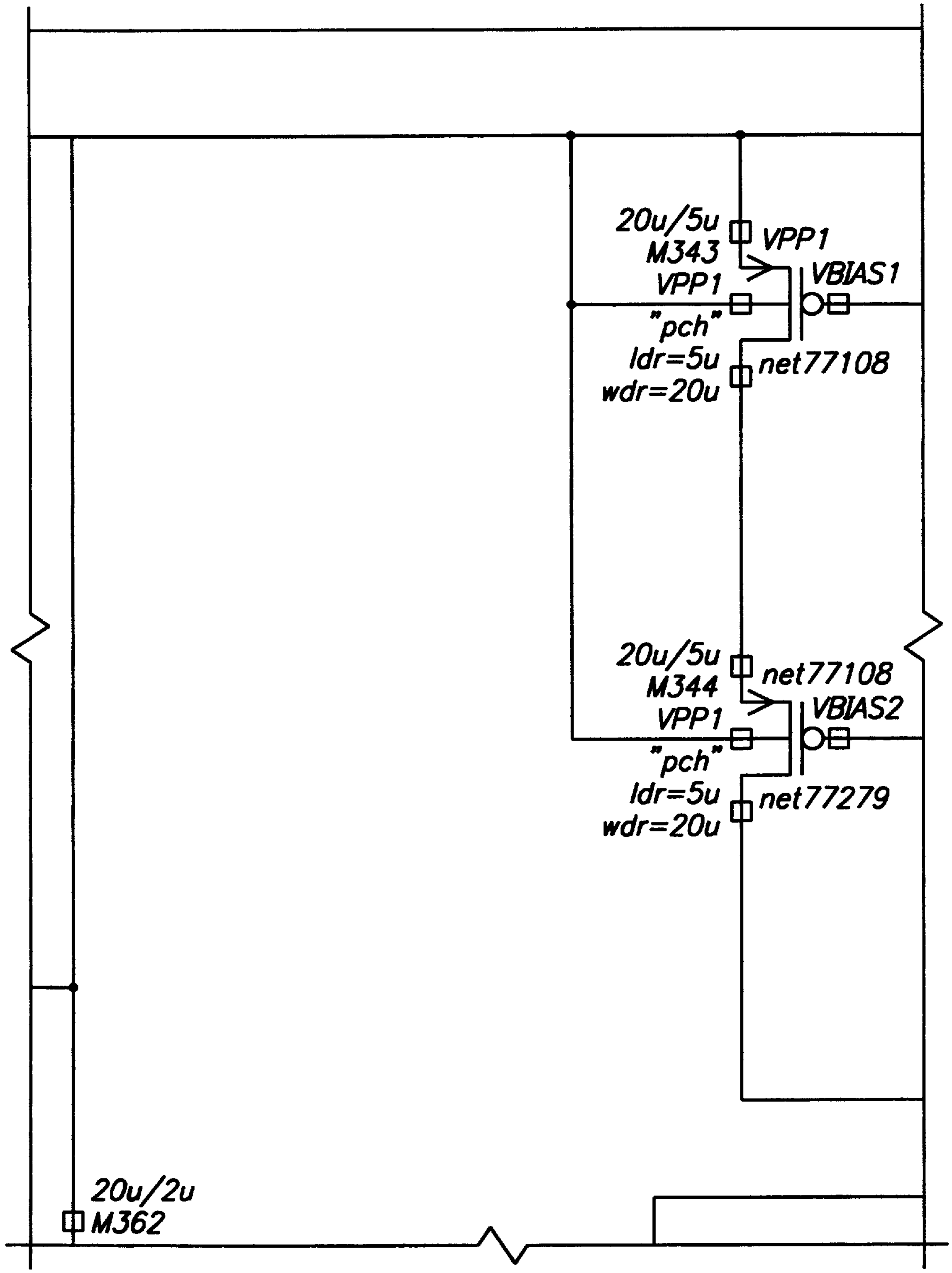
Fig 9.0301AC

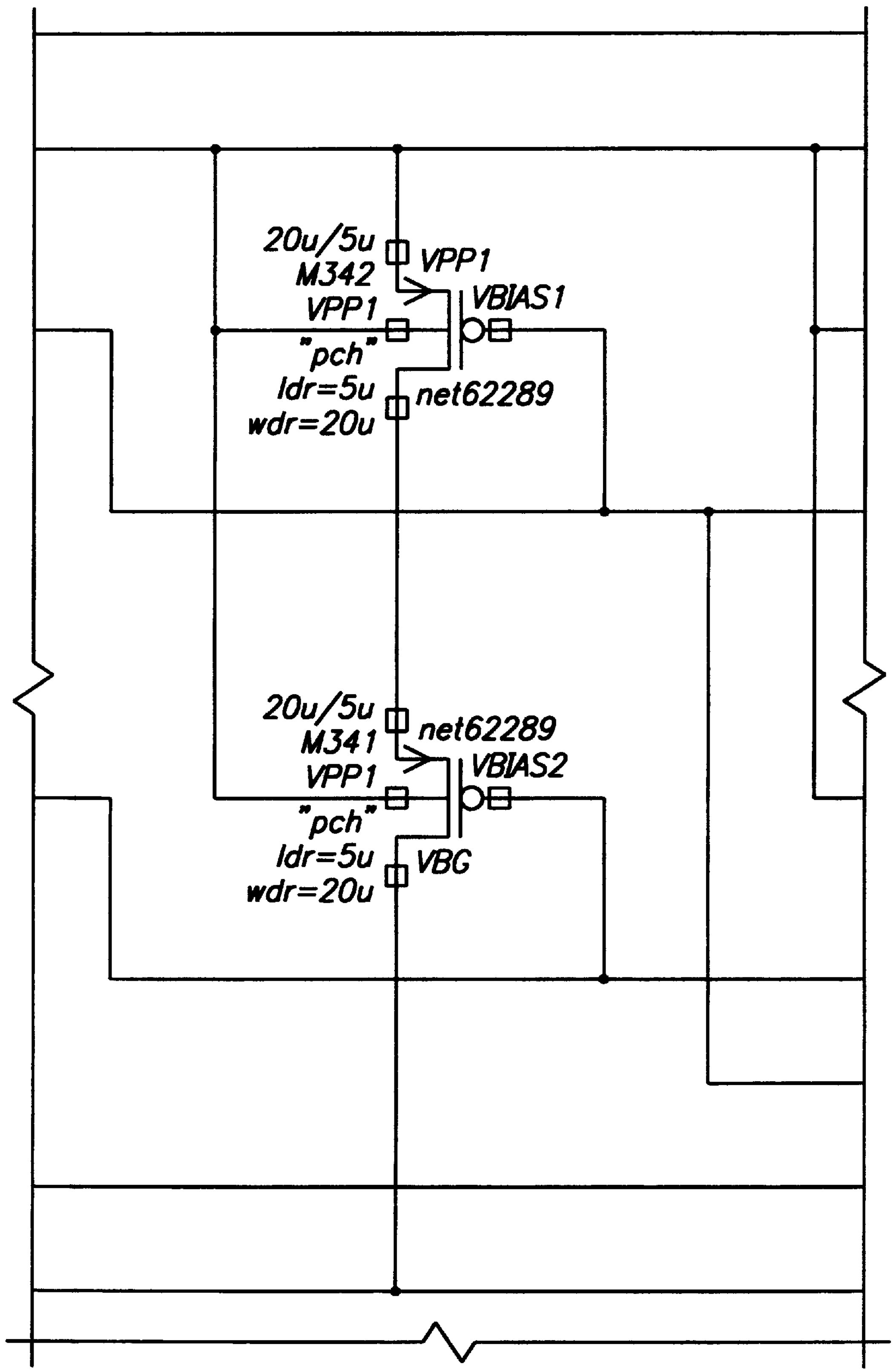
Fig 9.030.1AD

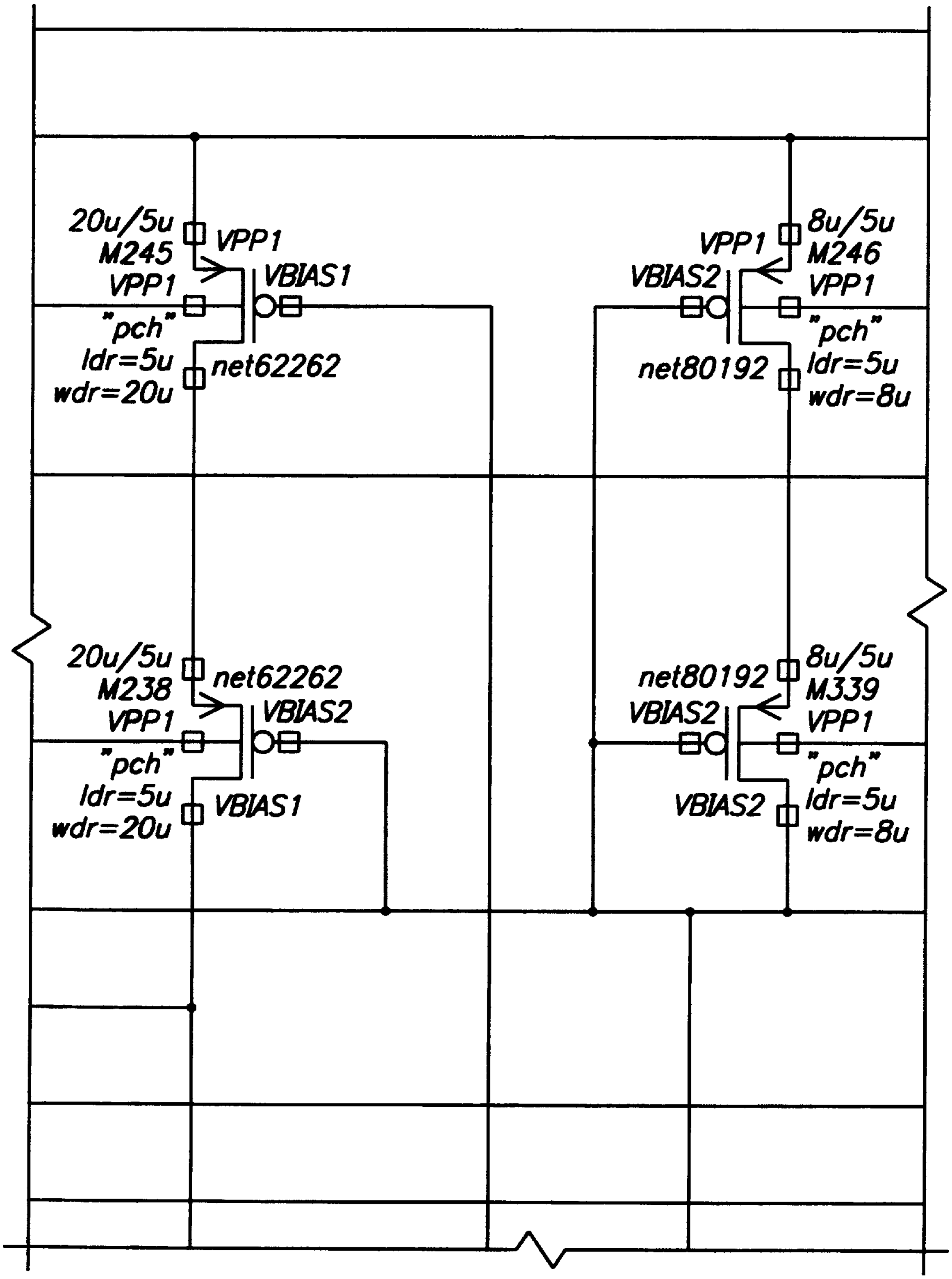
Fig 9.030.1AE

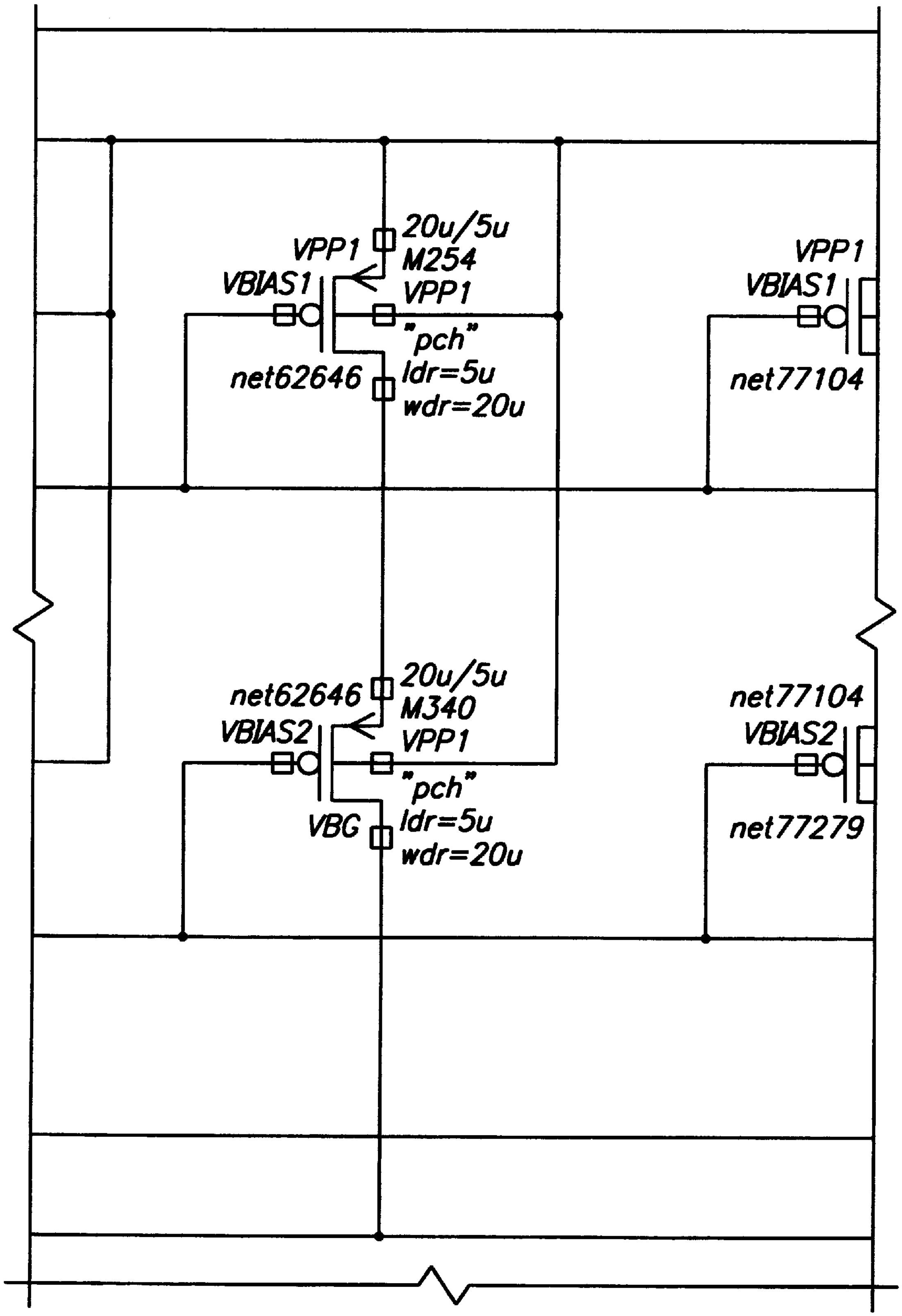
FIG 9.0301AF

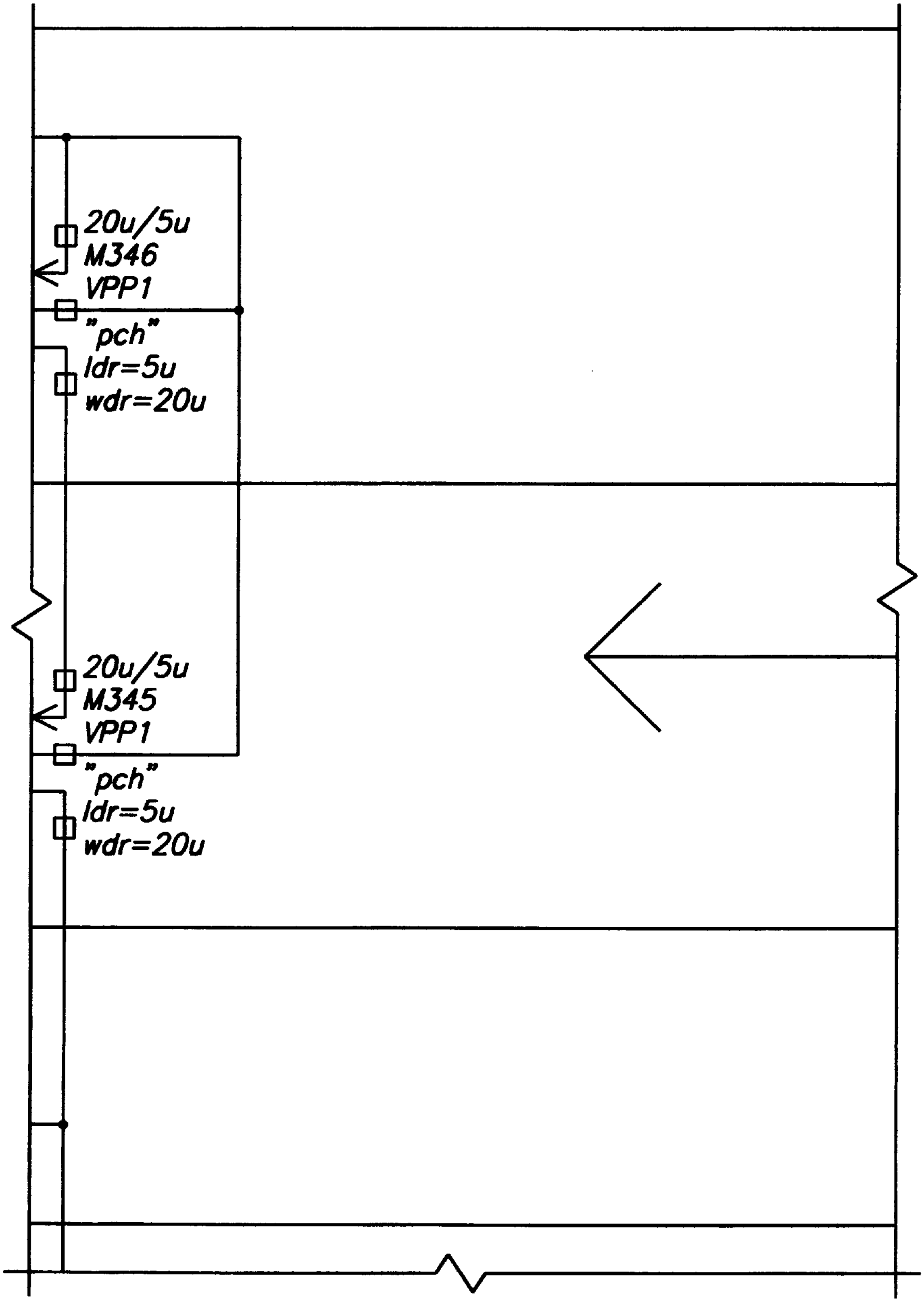
FIG 9.0301AG

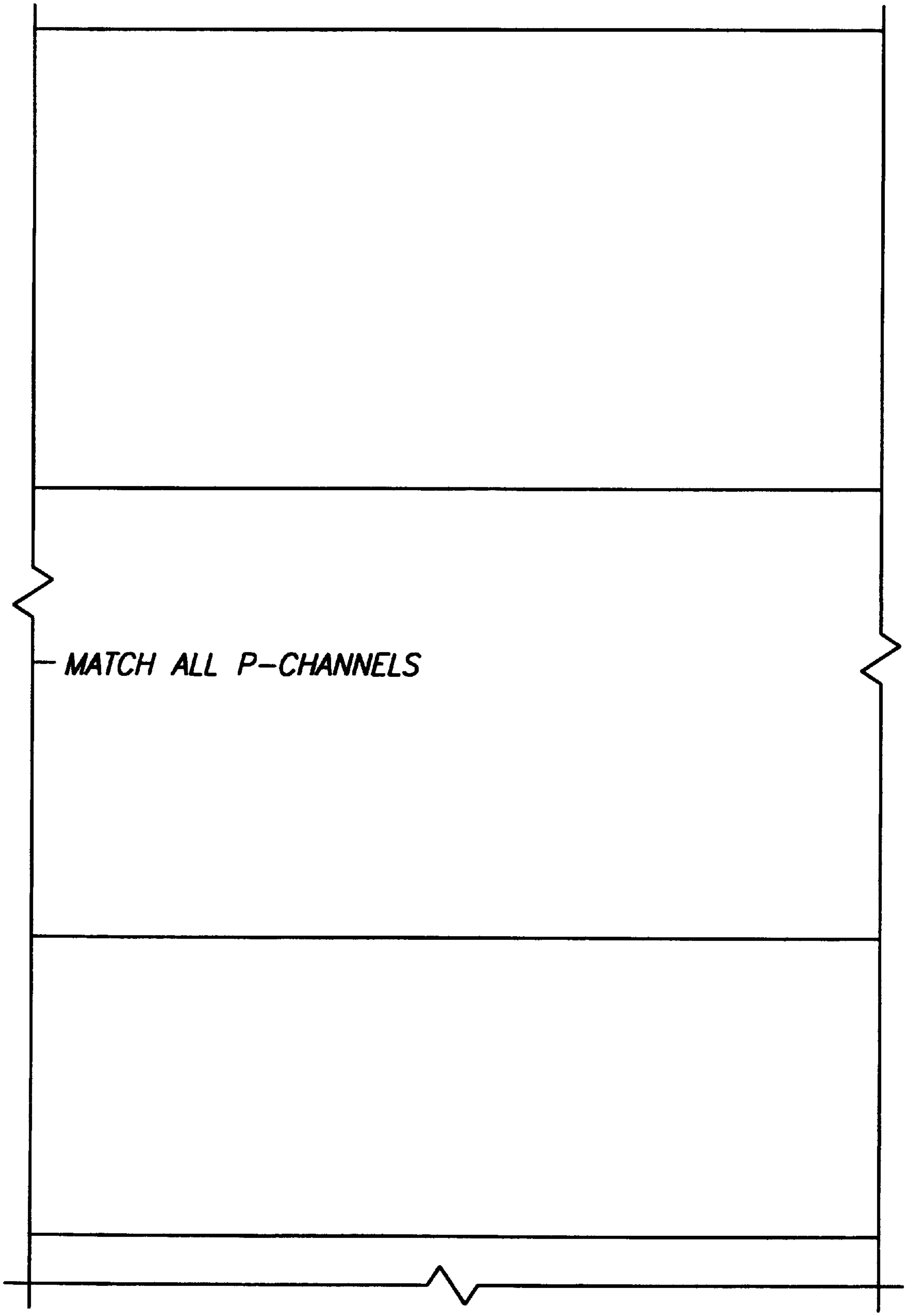
FIG 9.0301AH

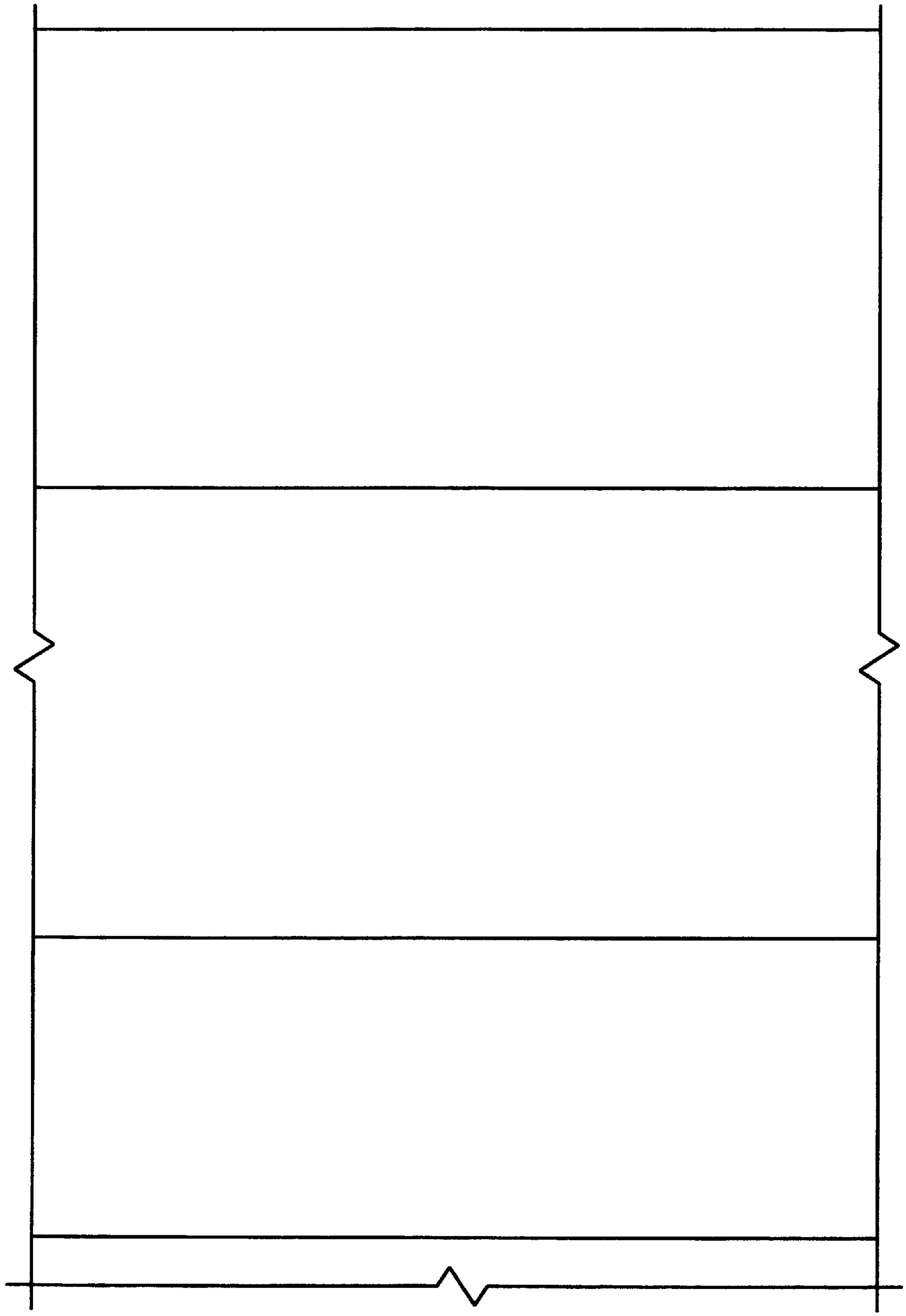
Fig 9.0301AI

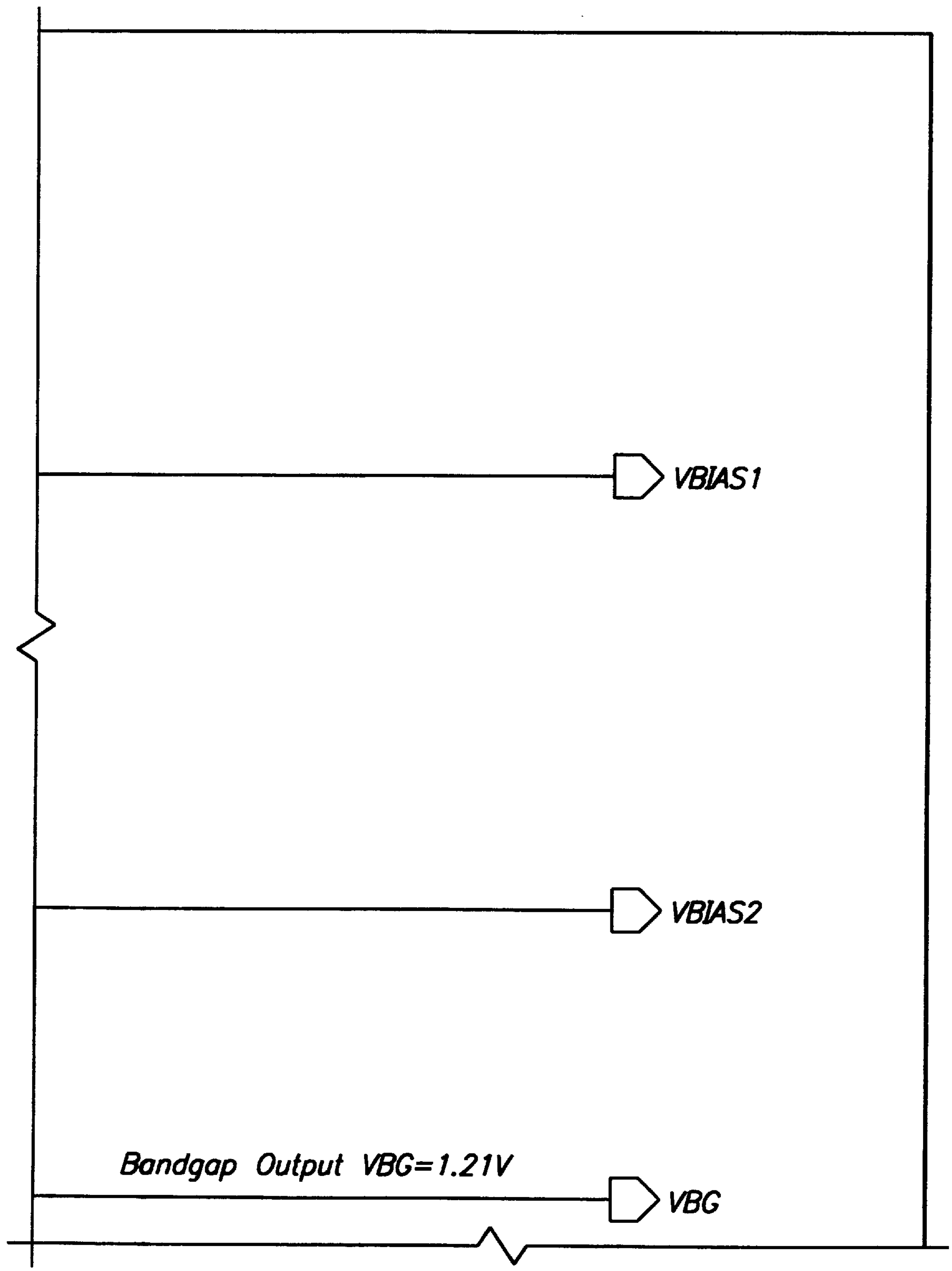
Fig 9.0301Aa

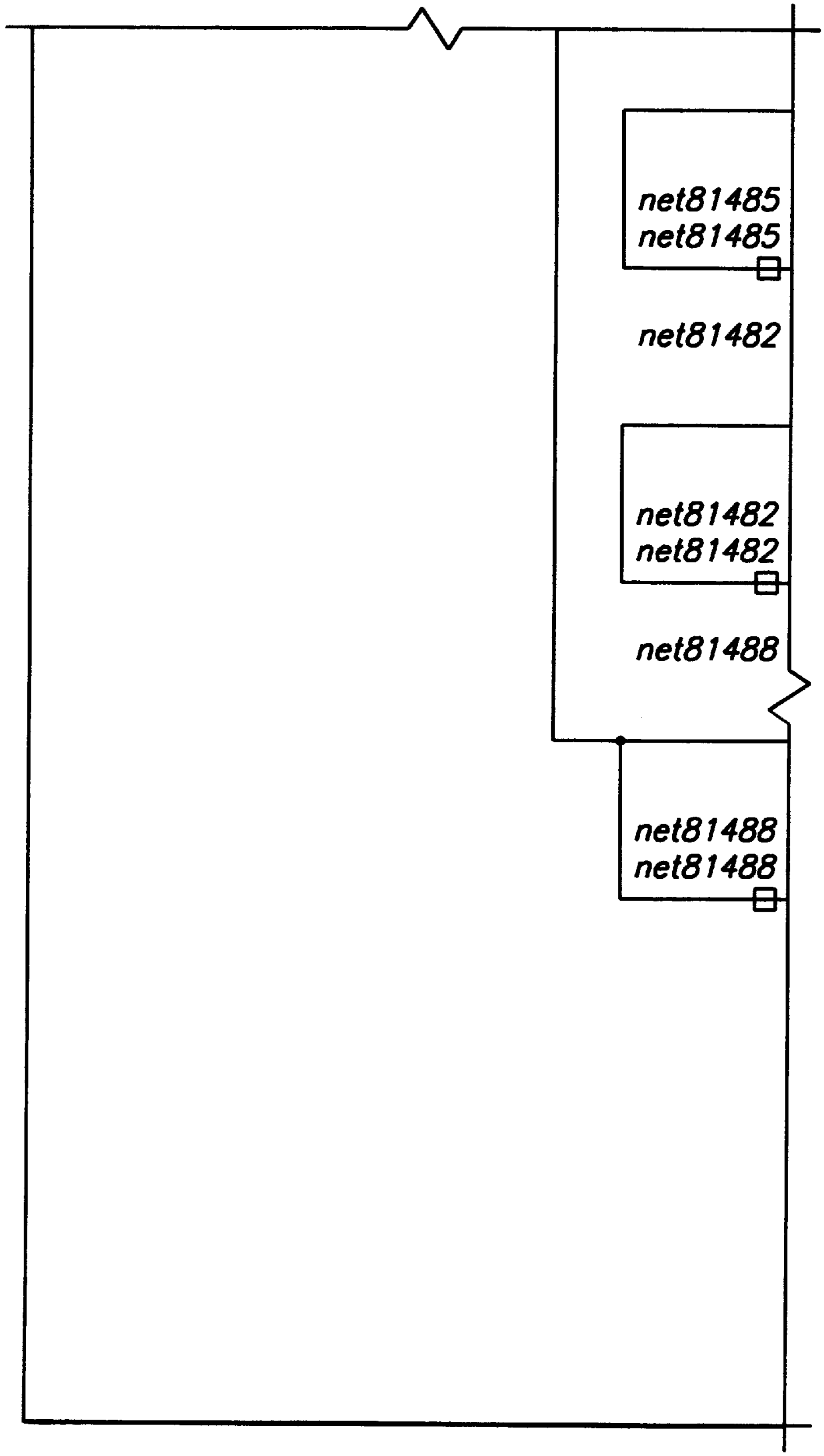
Fig 9.03018A

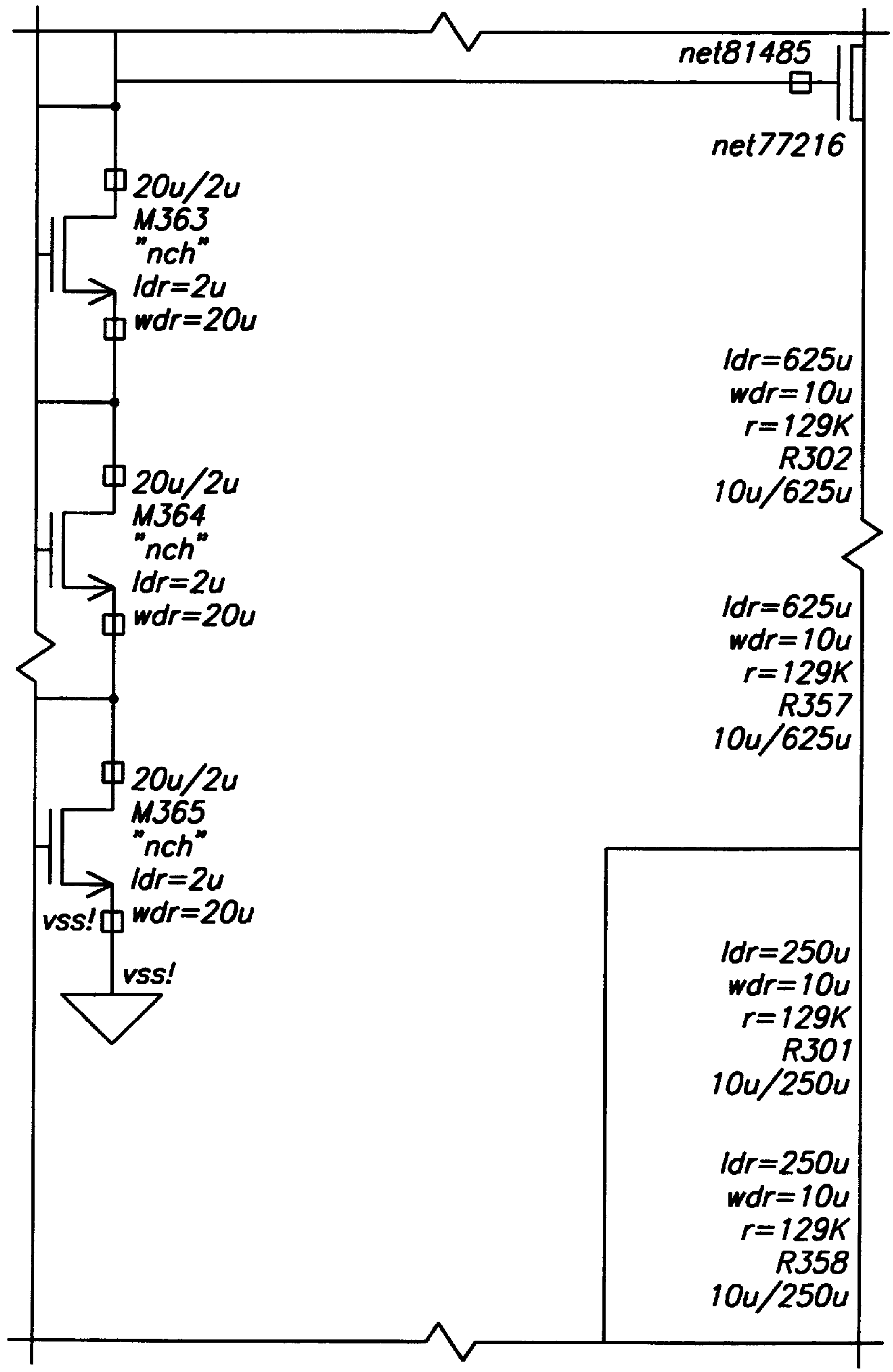
Fig 9.0301BB

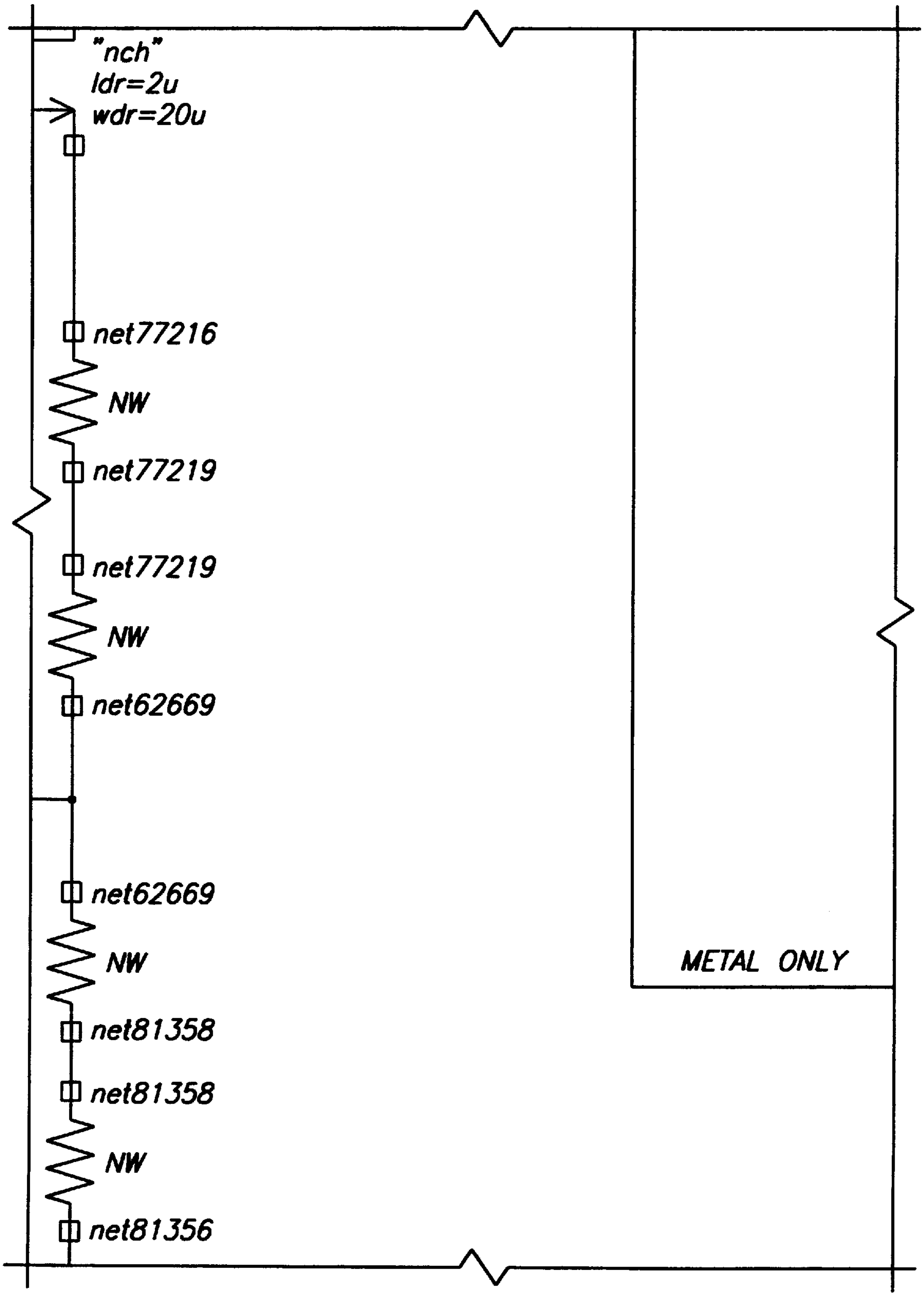
FIG 9.0301BC

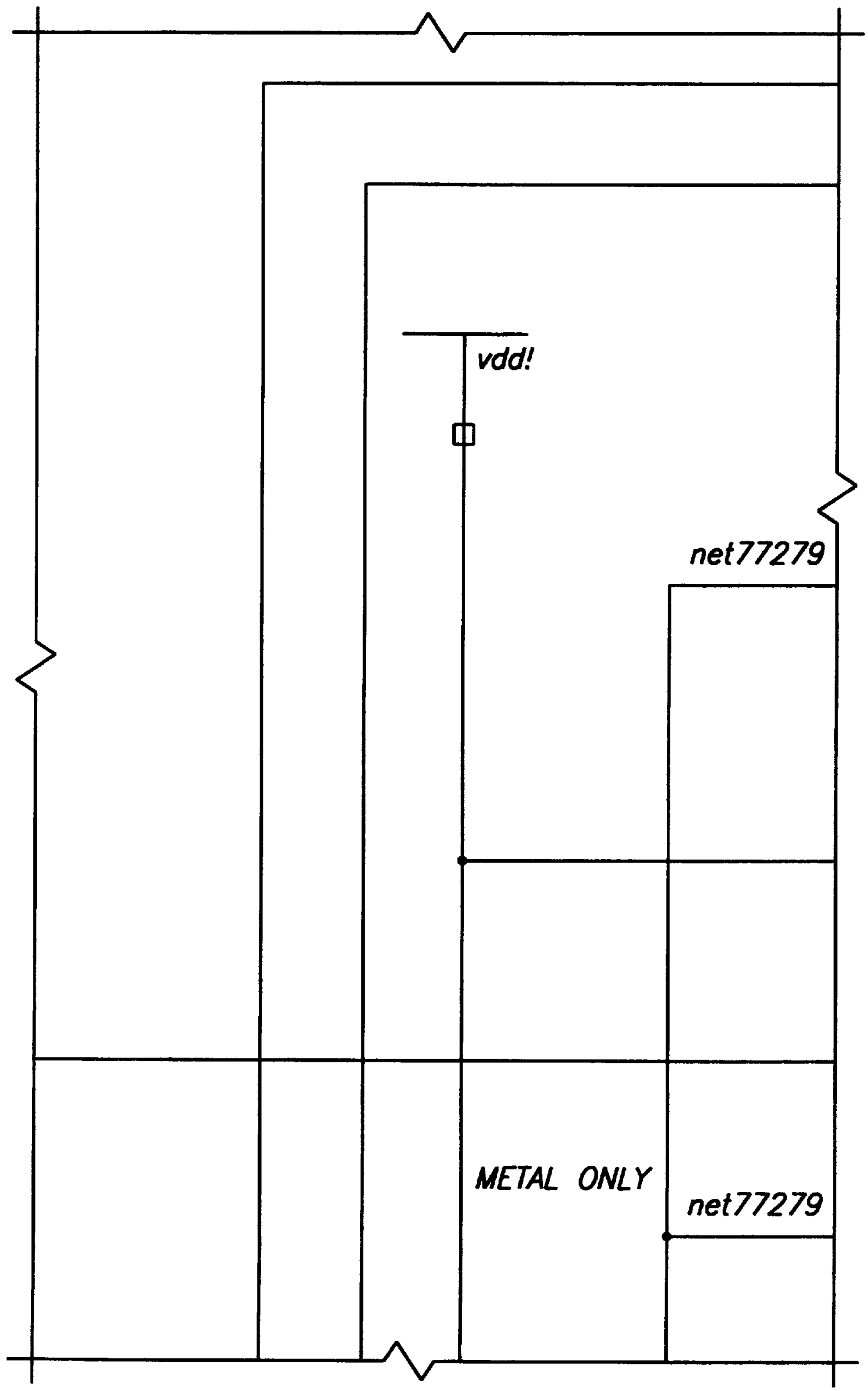
FIG. 9.030.1BD

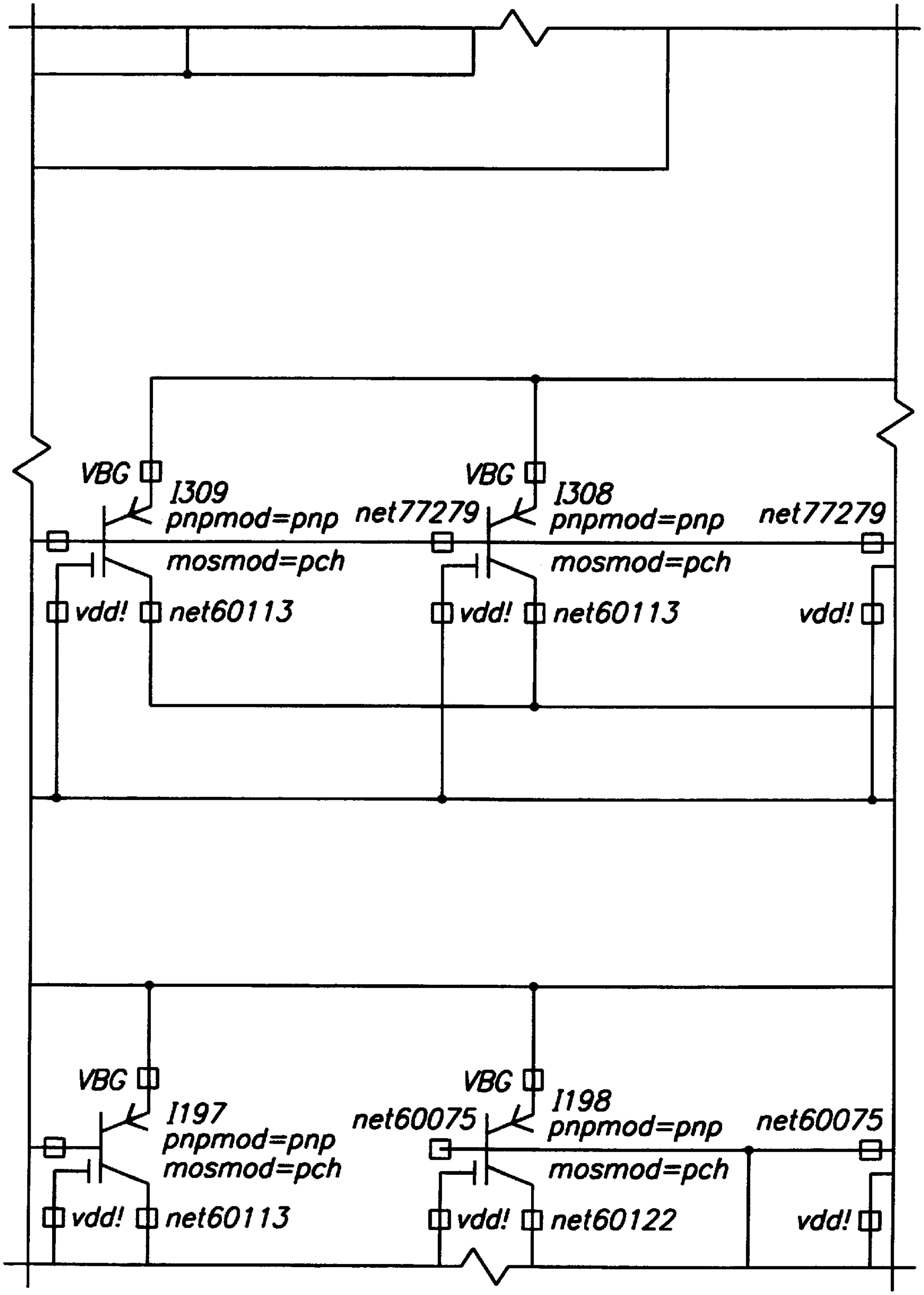
FIG 9.0301BE

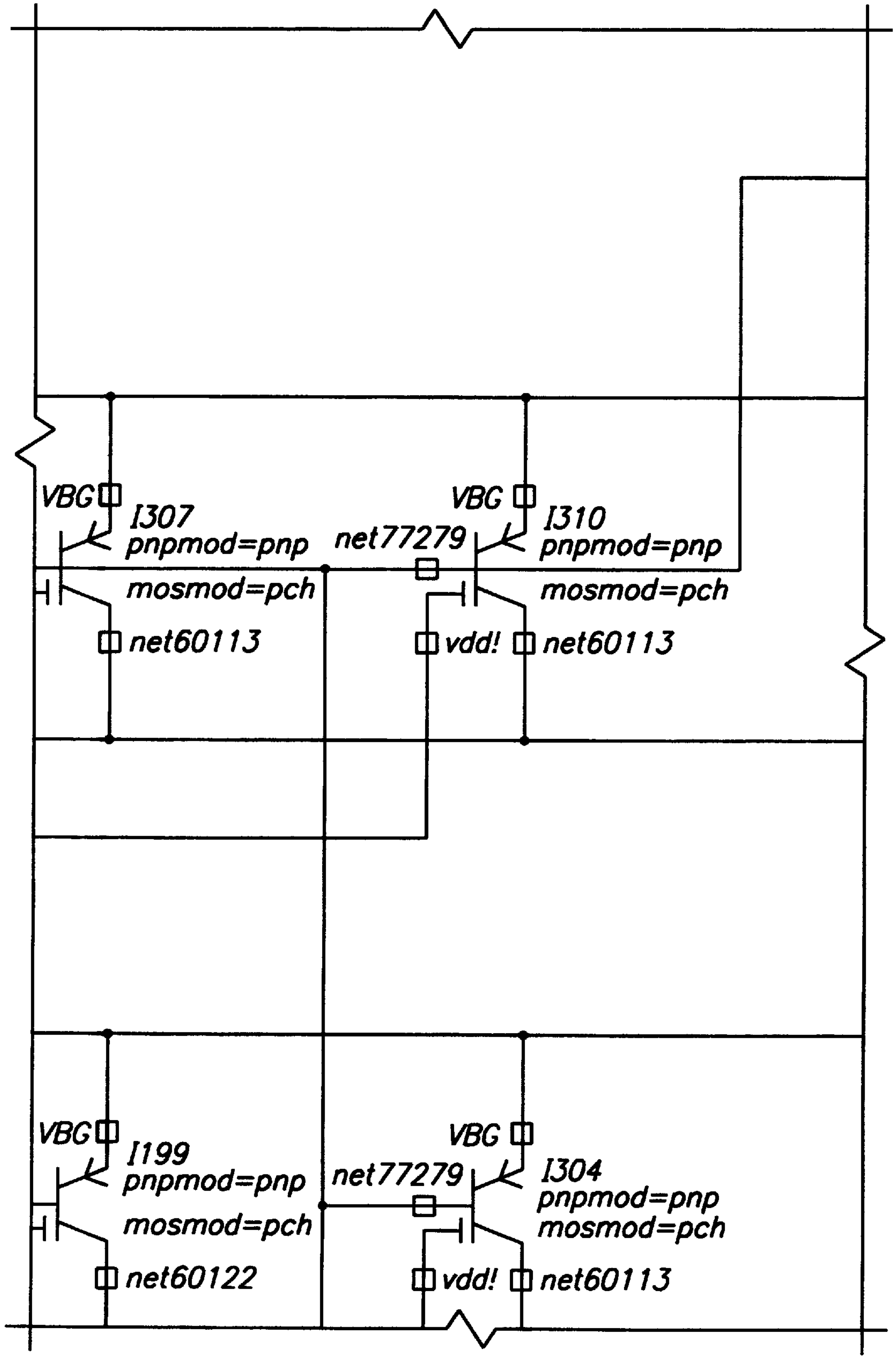
FIG 9.03013BF

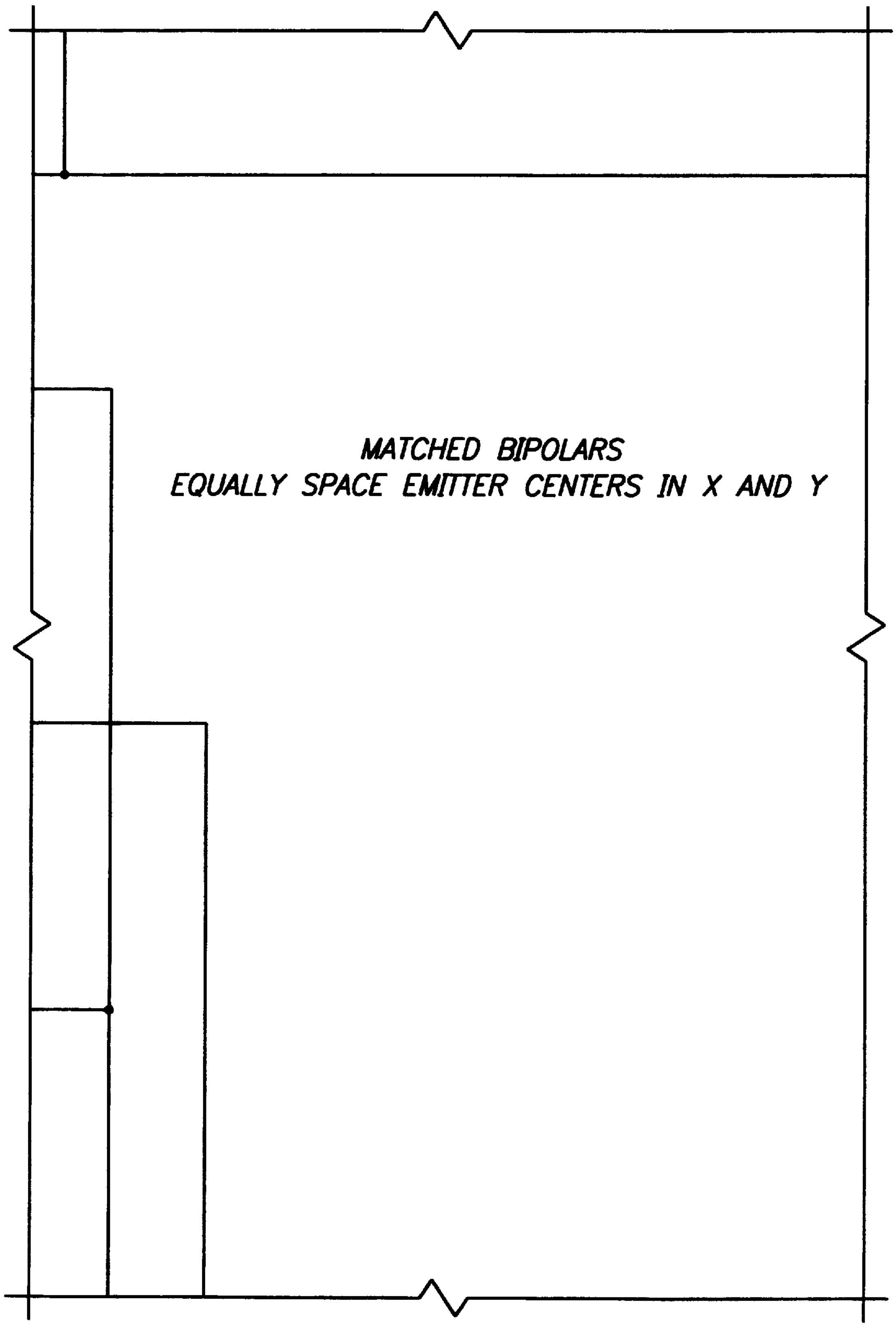
Fig 9.03018G

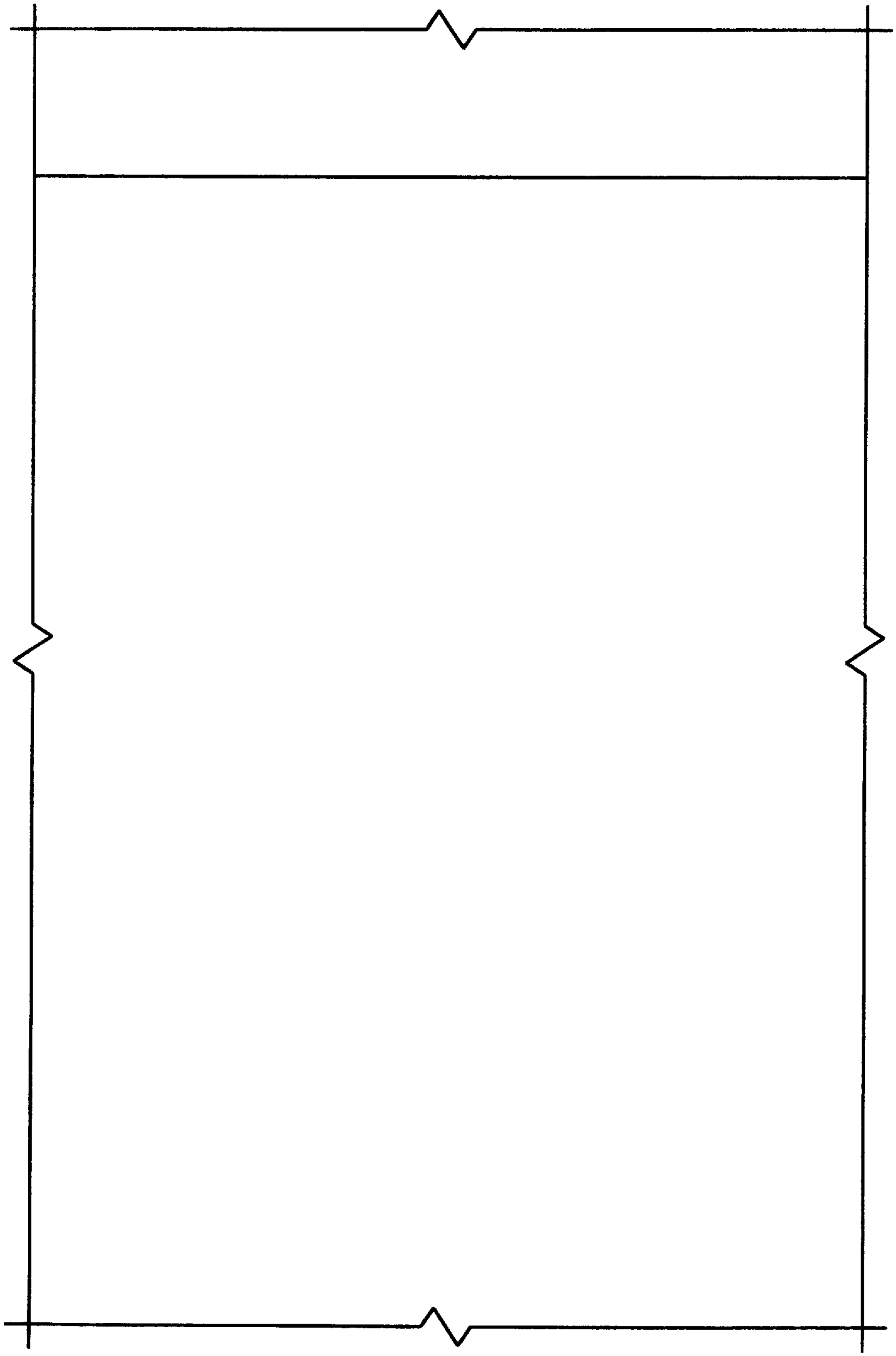
FIG. 9.0301BH

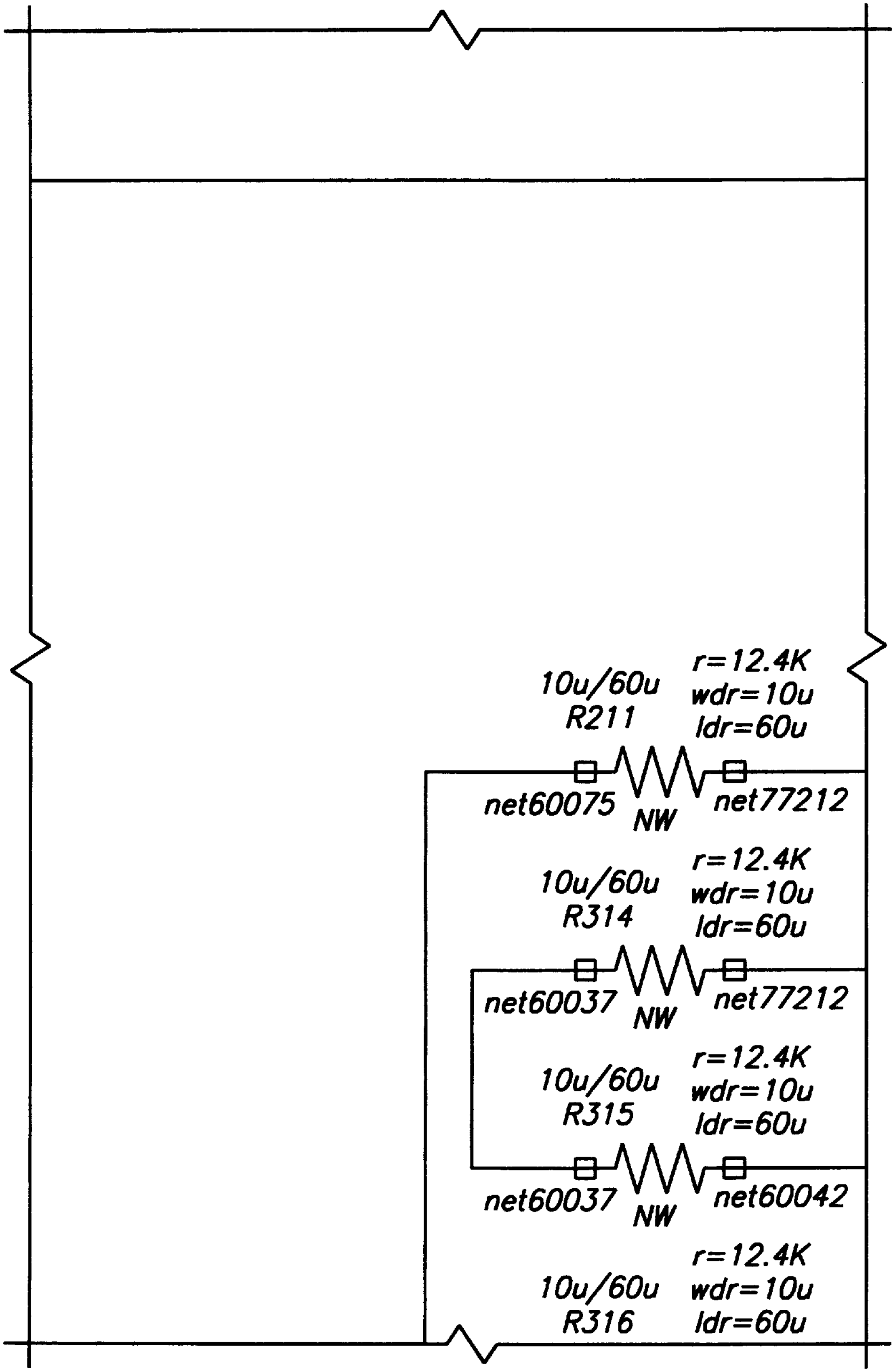
Fig 9.030.1BI

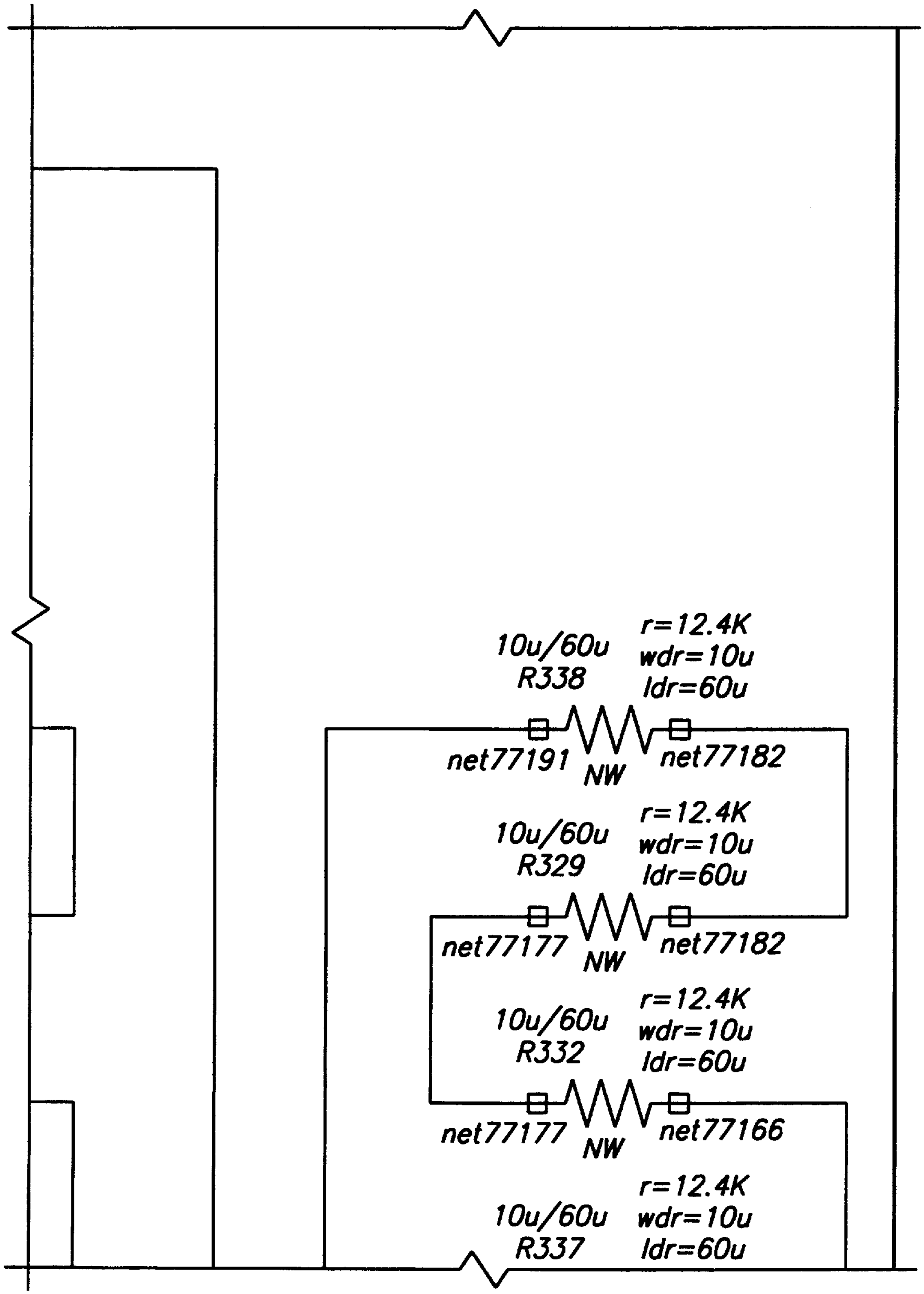
Fig. 9.03013a

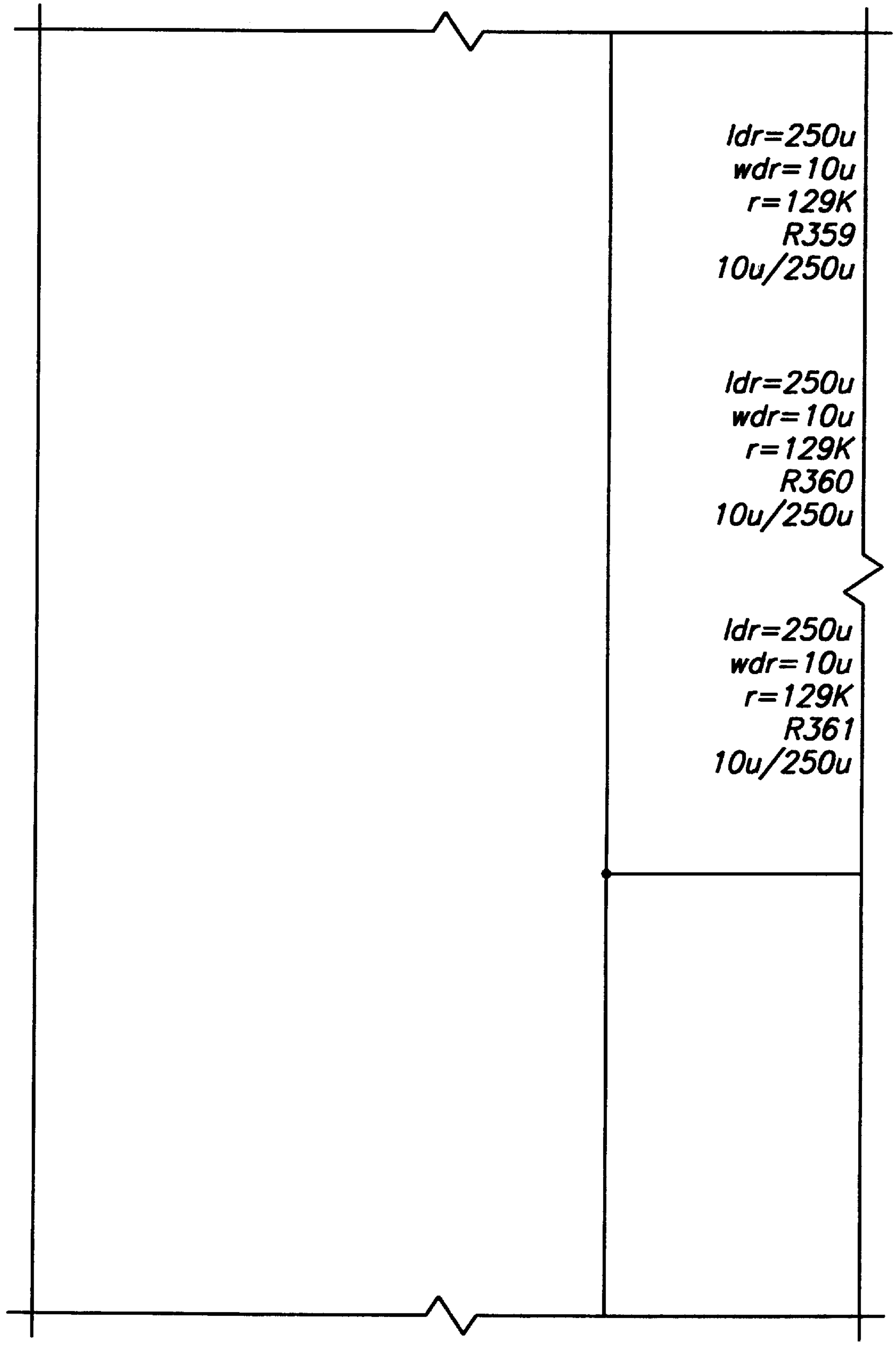
FIG 9.03O1CB

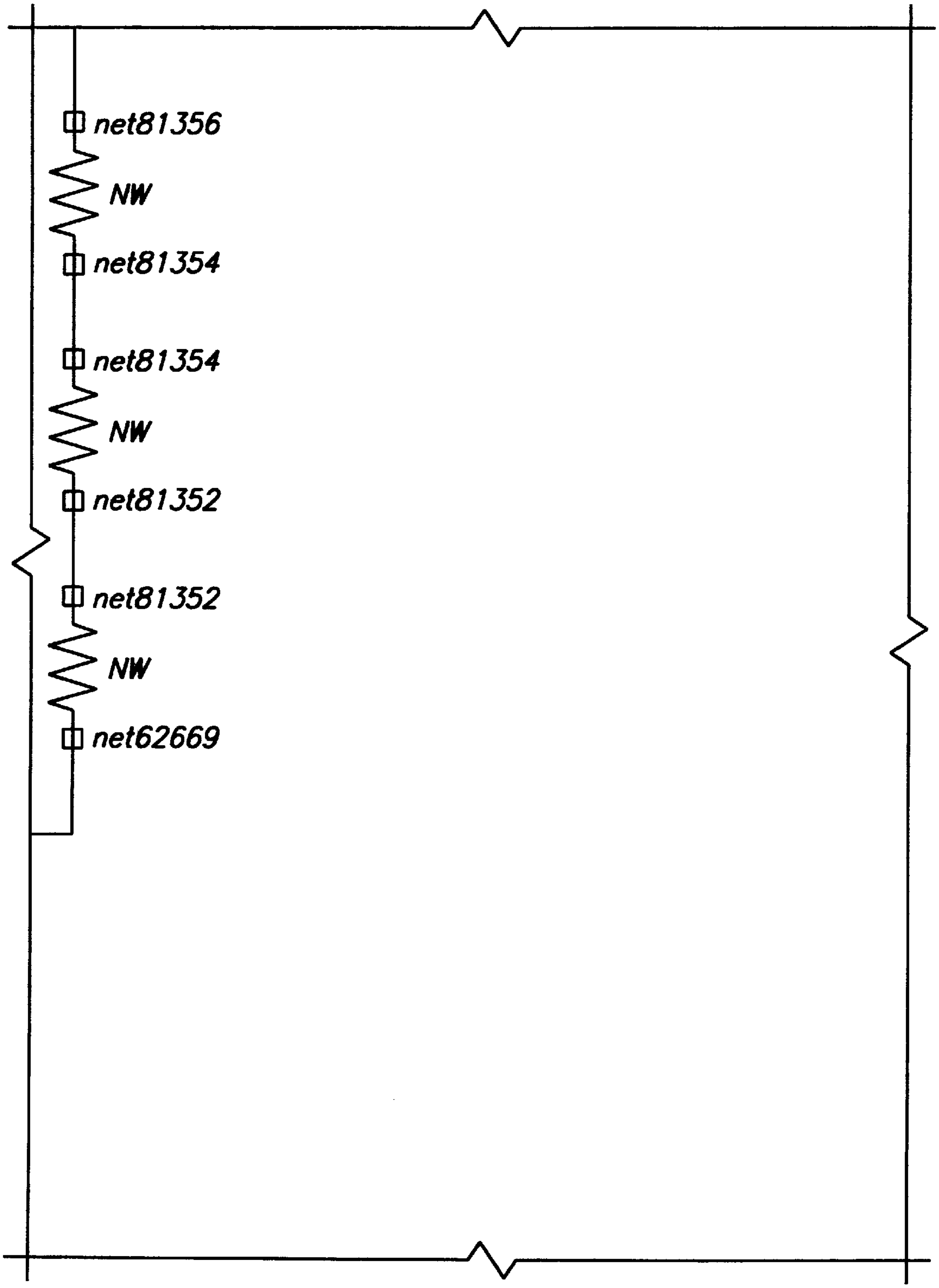
Fig 9.0301CC

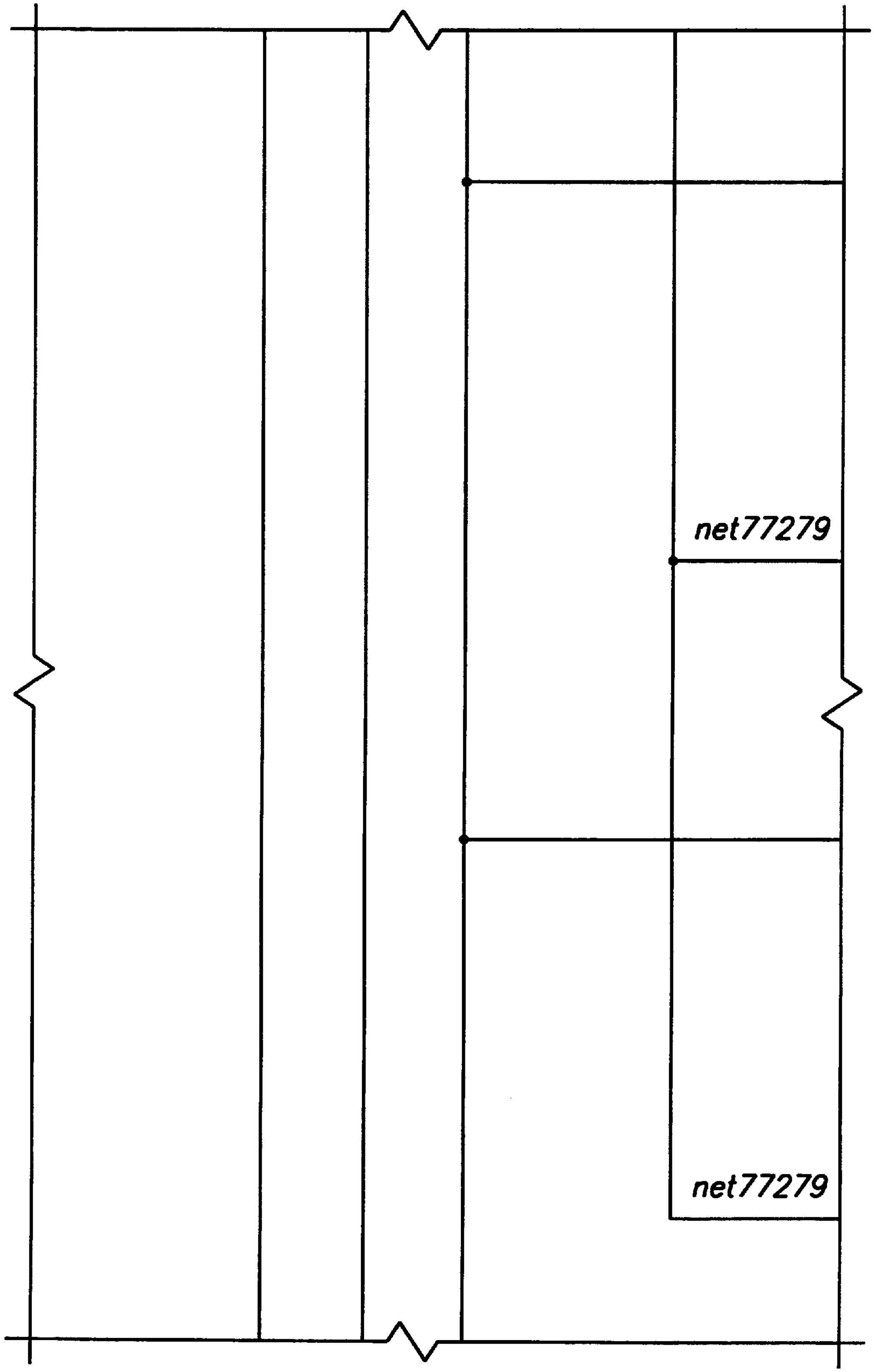
Fig 9.03011CD

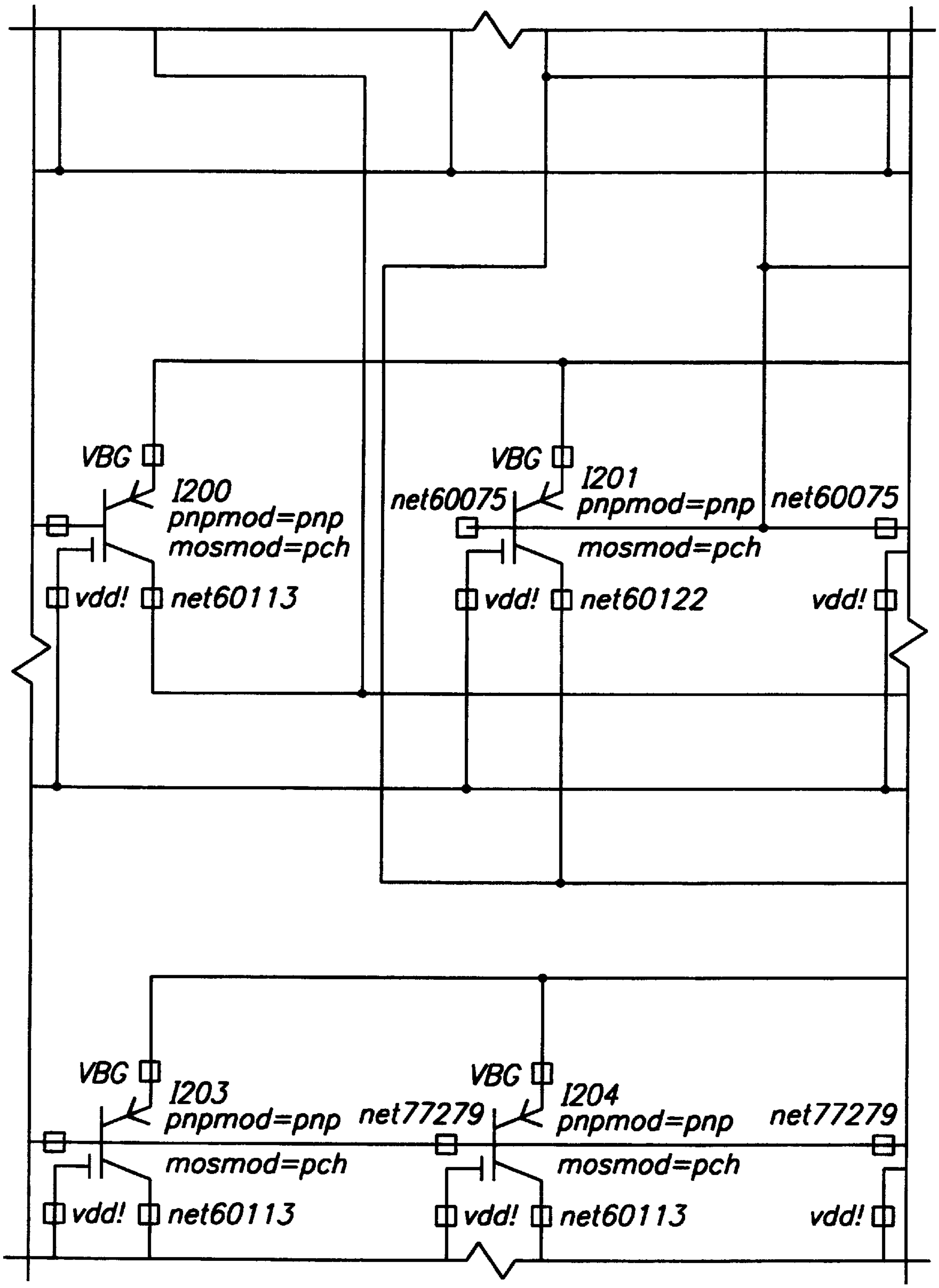
Fig 9.030ICE

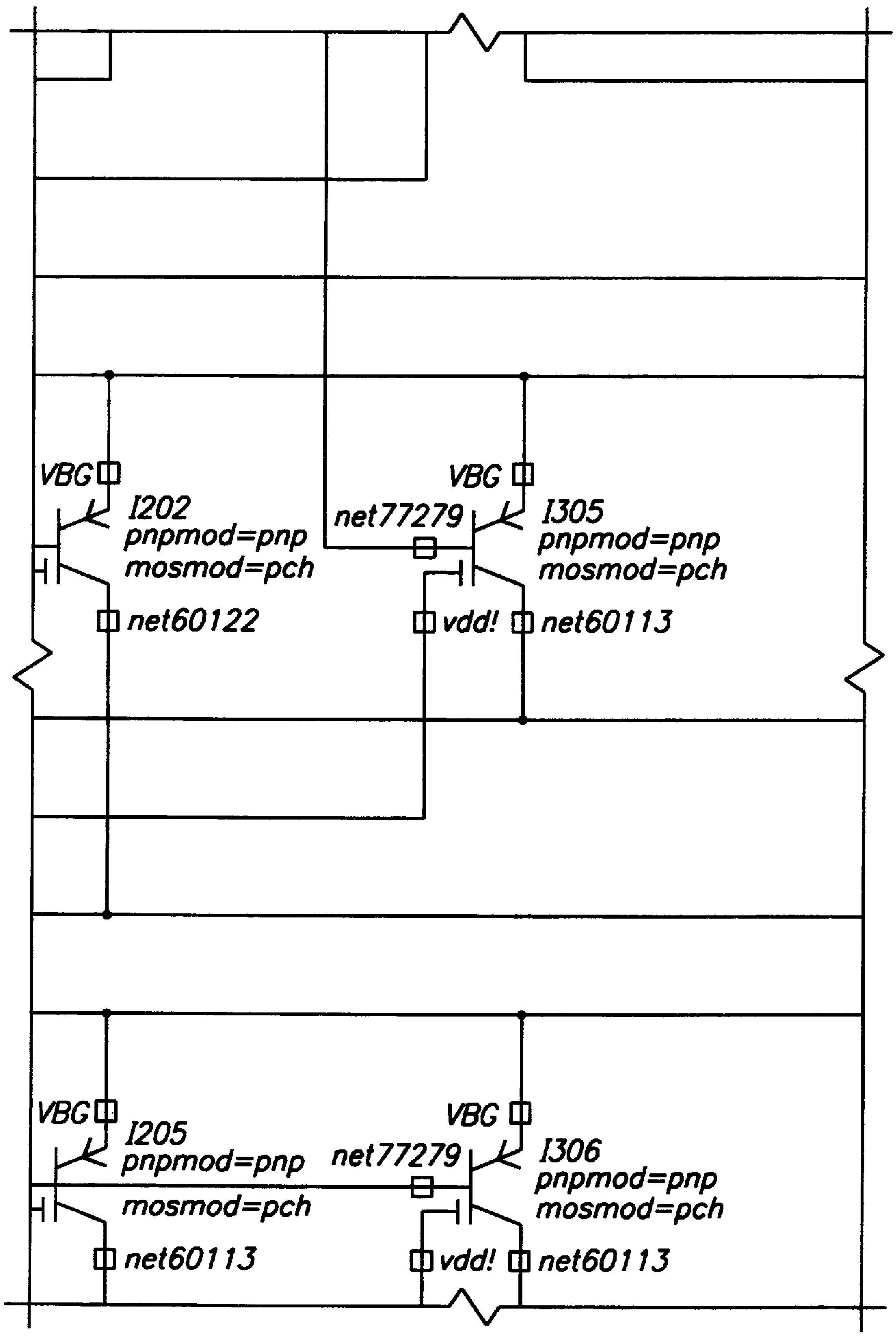
Fig 9.030ICF

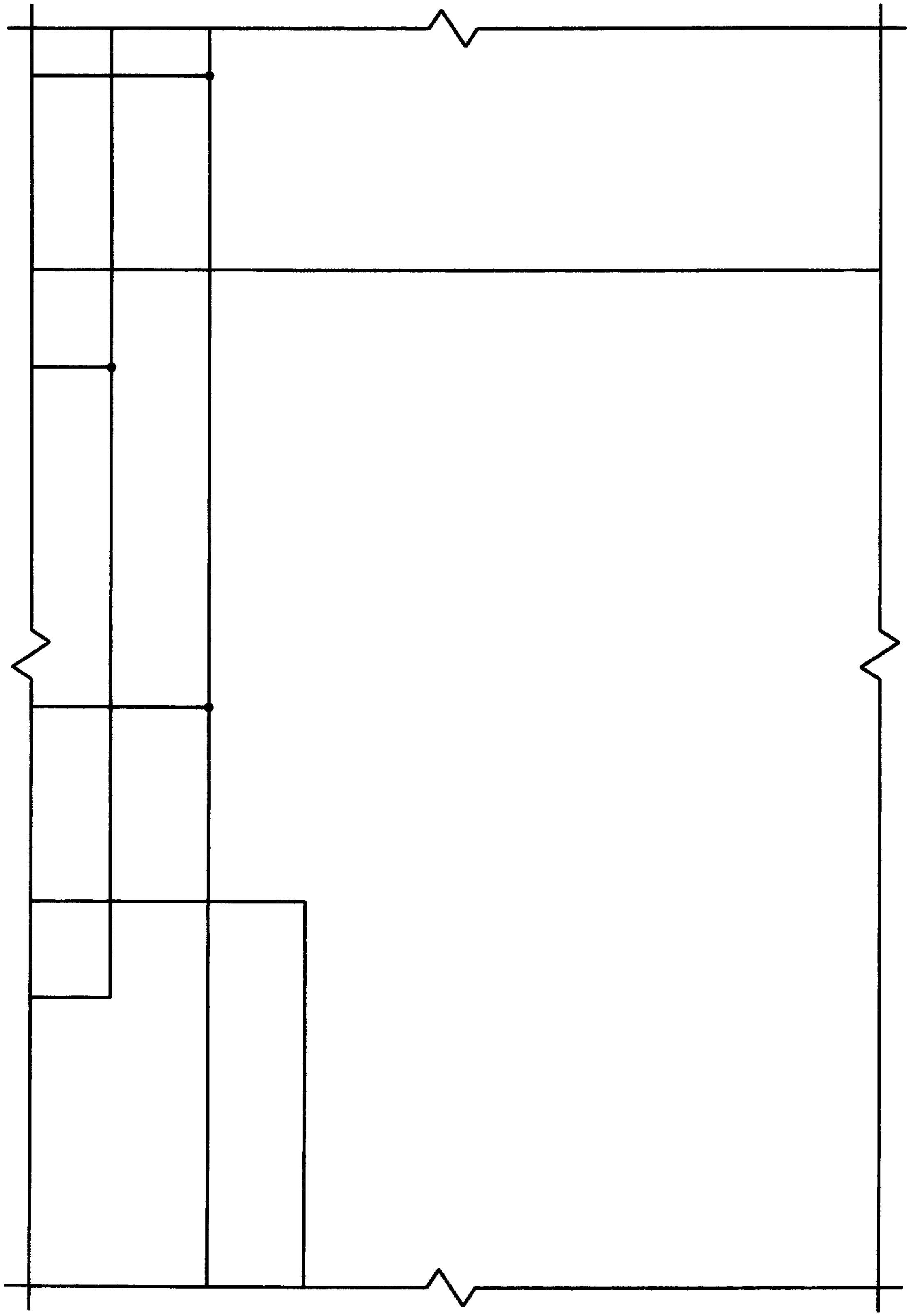
Fig 9.0301CG

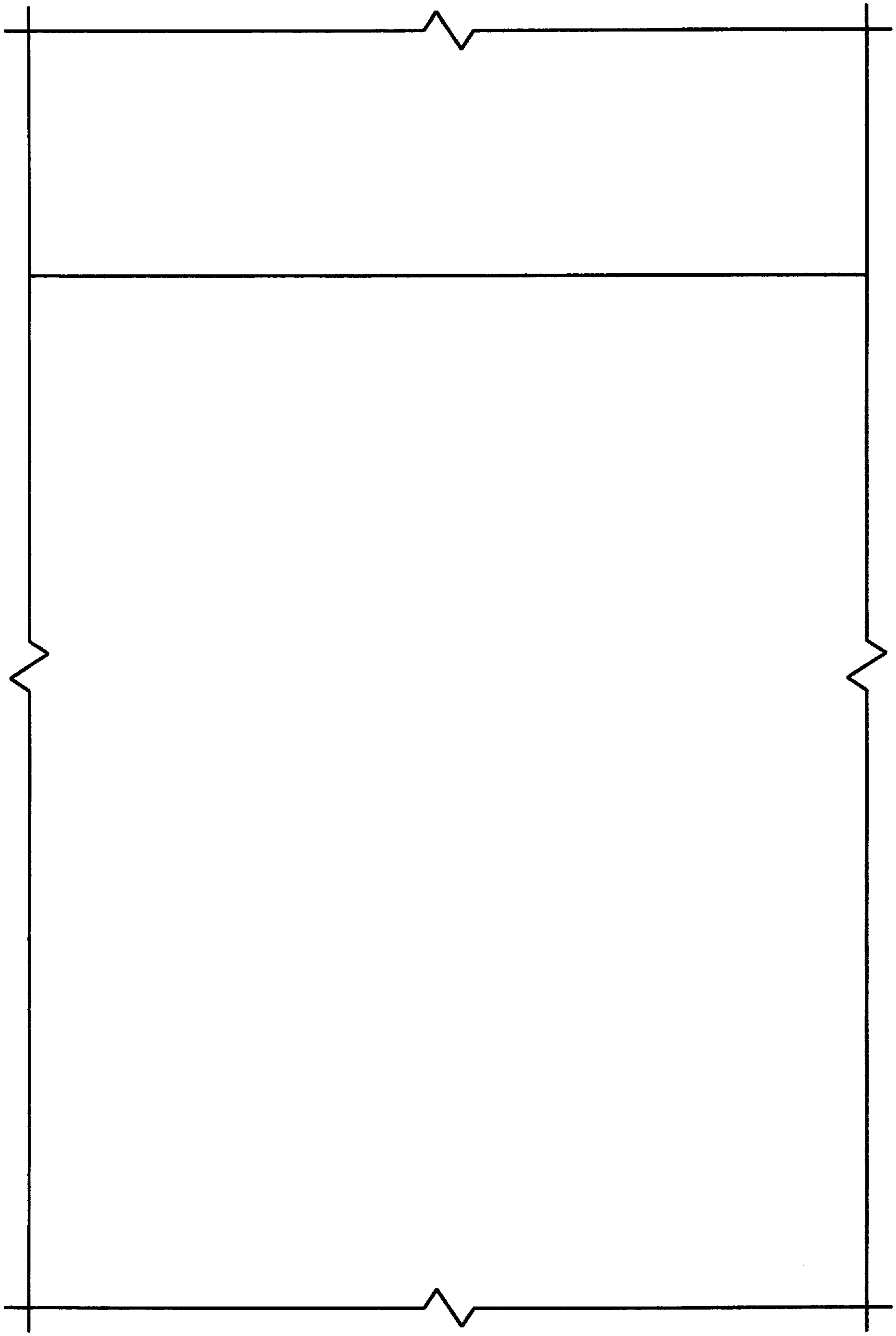
Fig 9.03O1CH

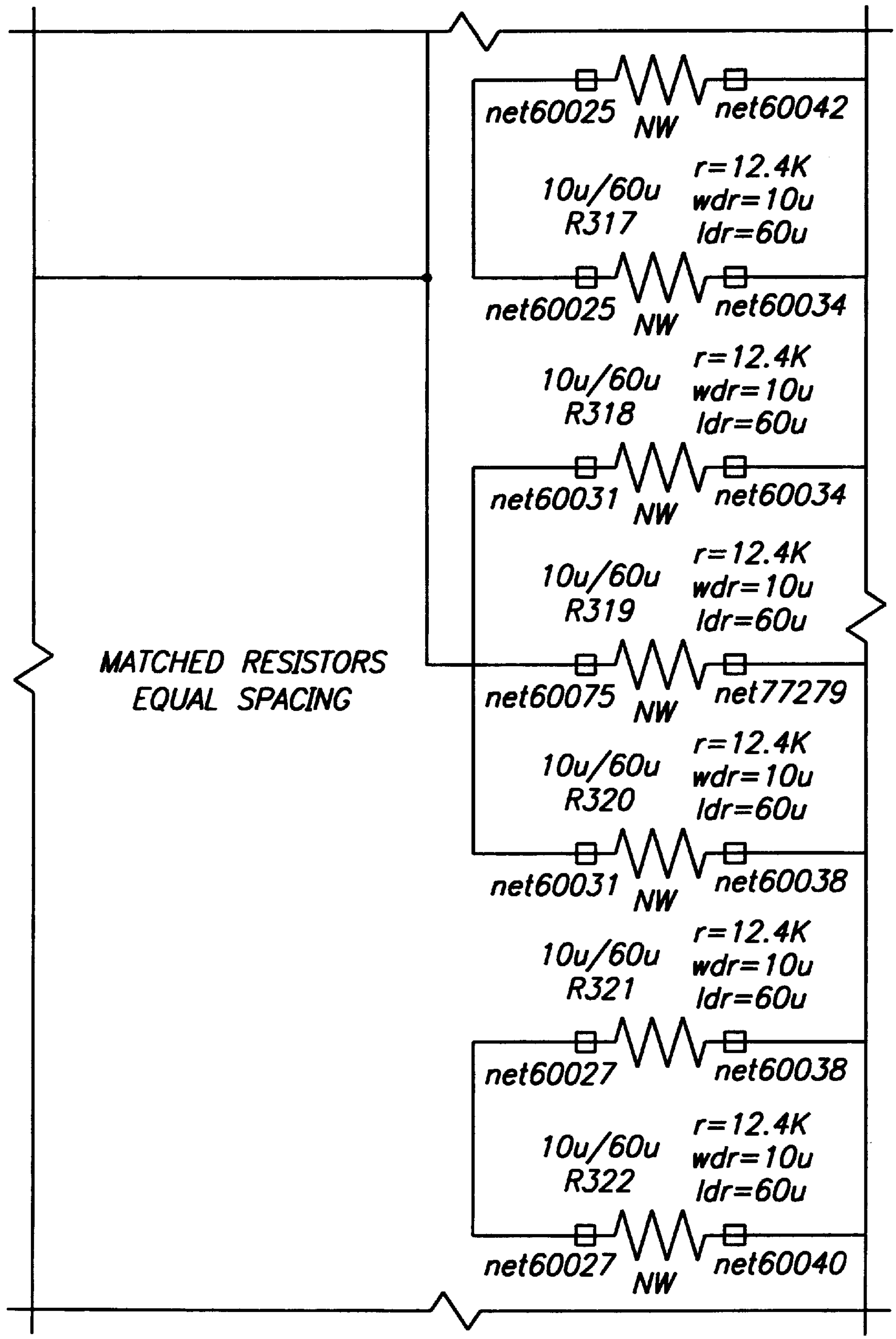
FIG 9.03D1C1

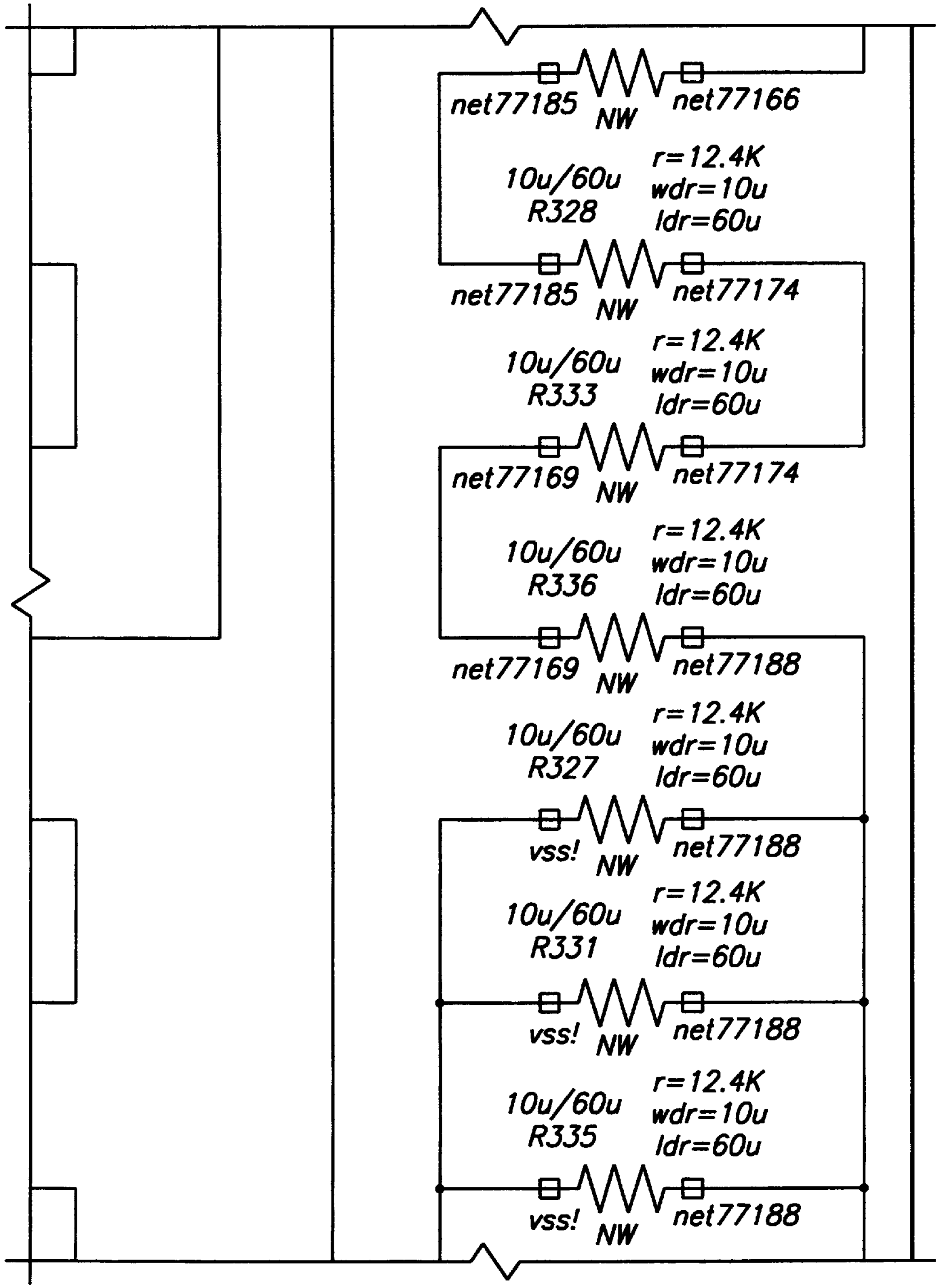
Fig 9.0301Cd

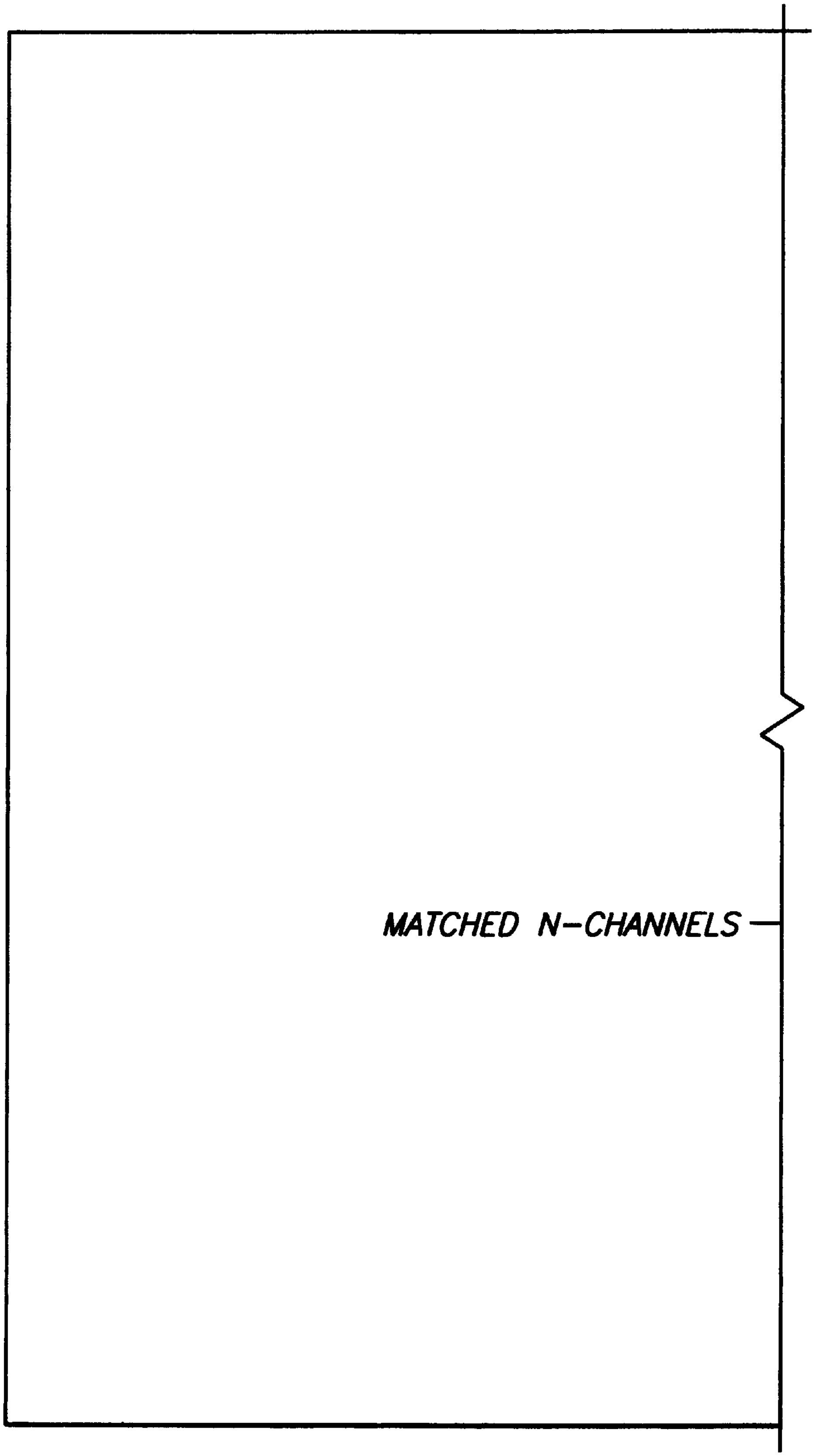
Fig. 9.0301DA

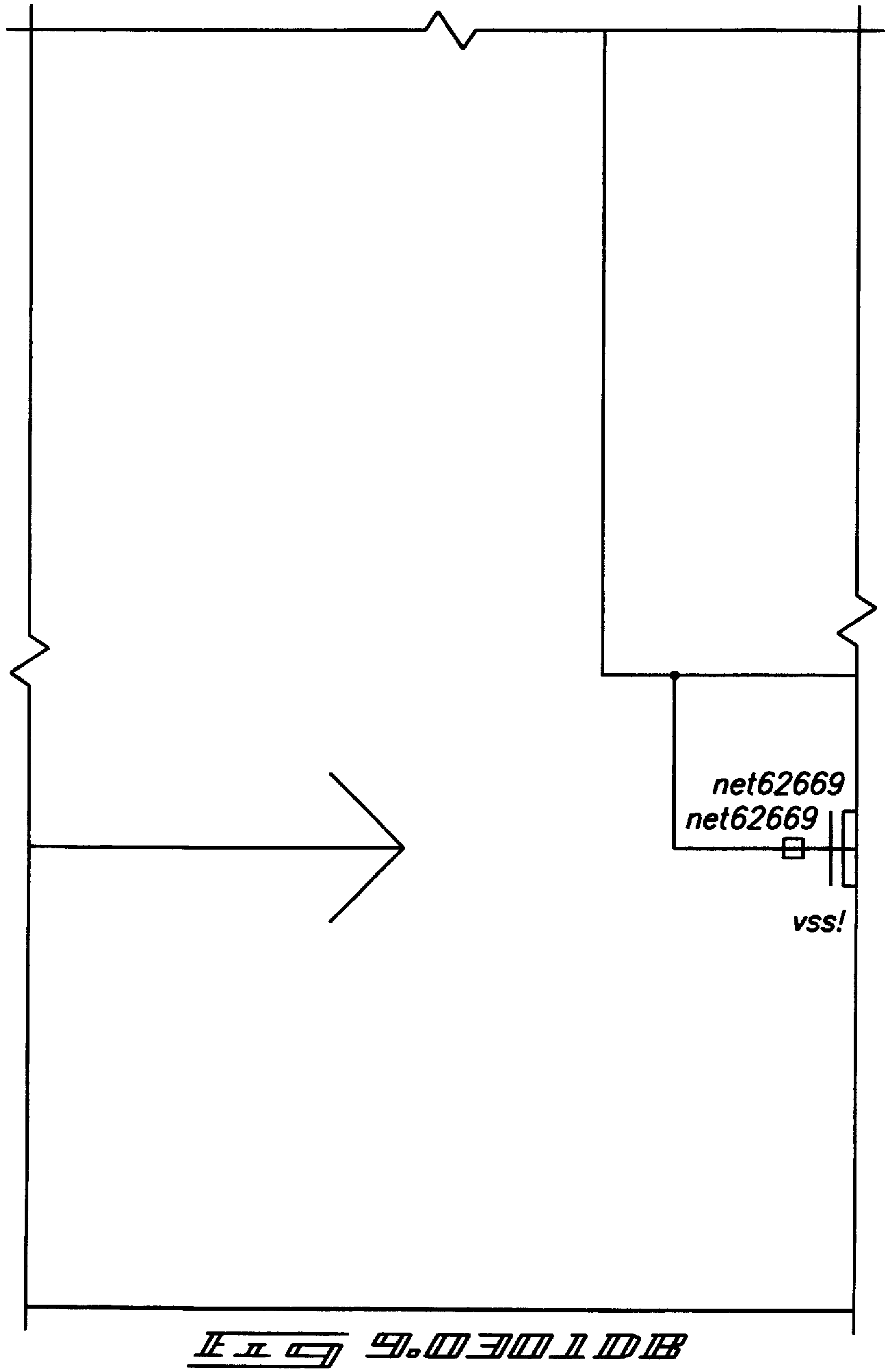
Fig 9.03101DB

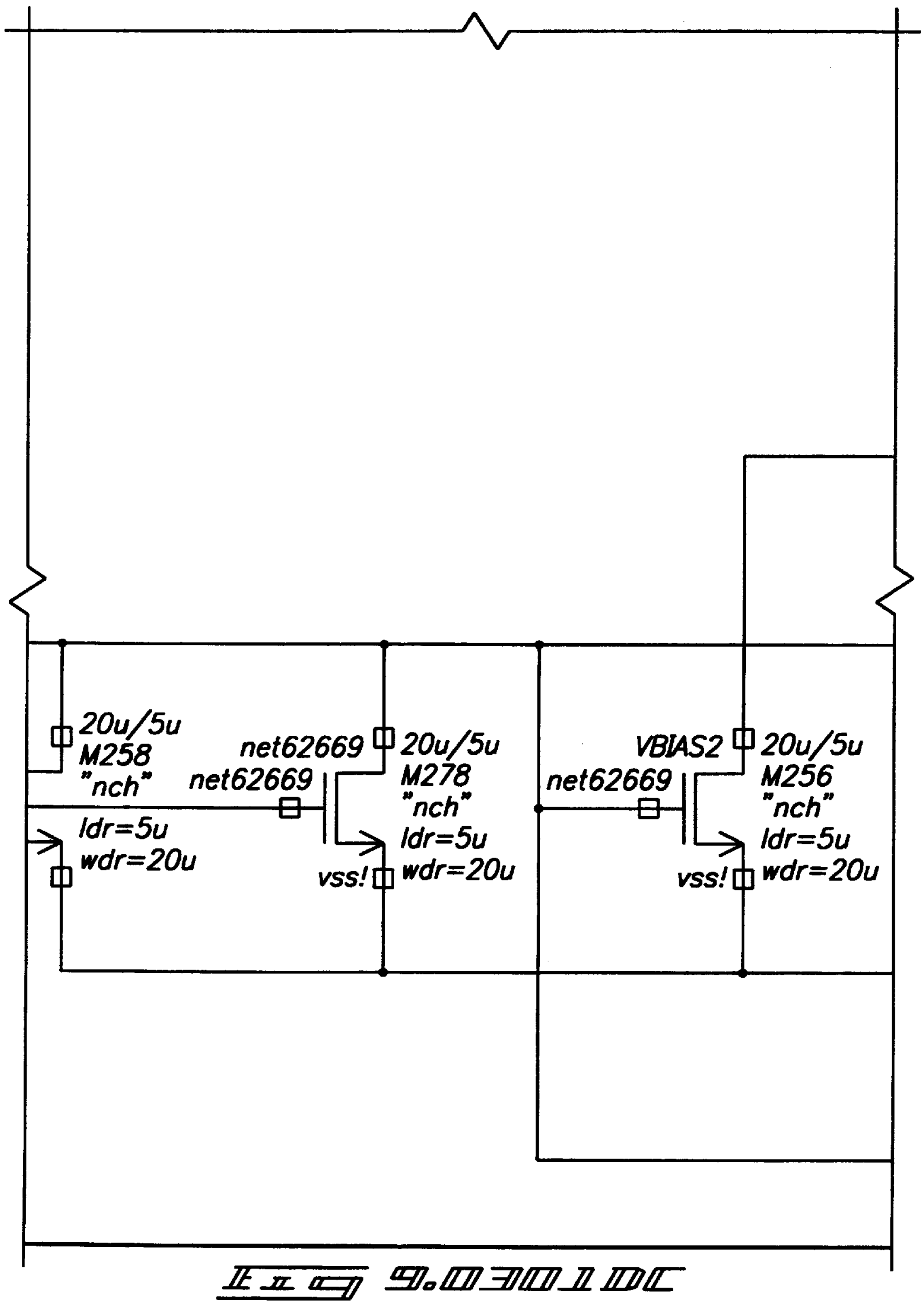
Fig 9.0301DC

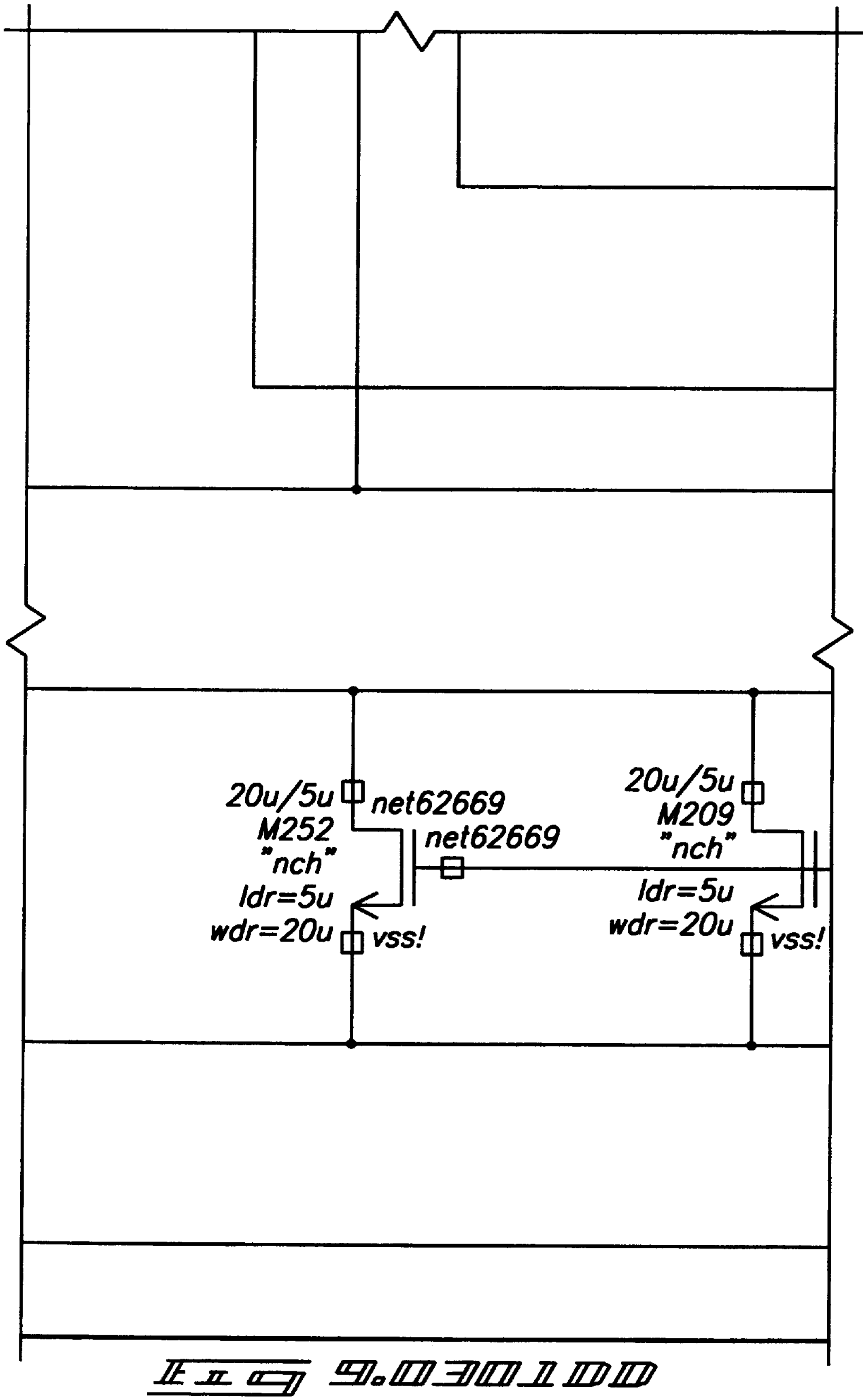
Fig 9.03011DD

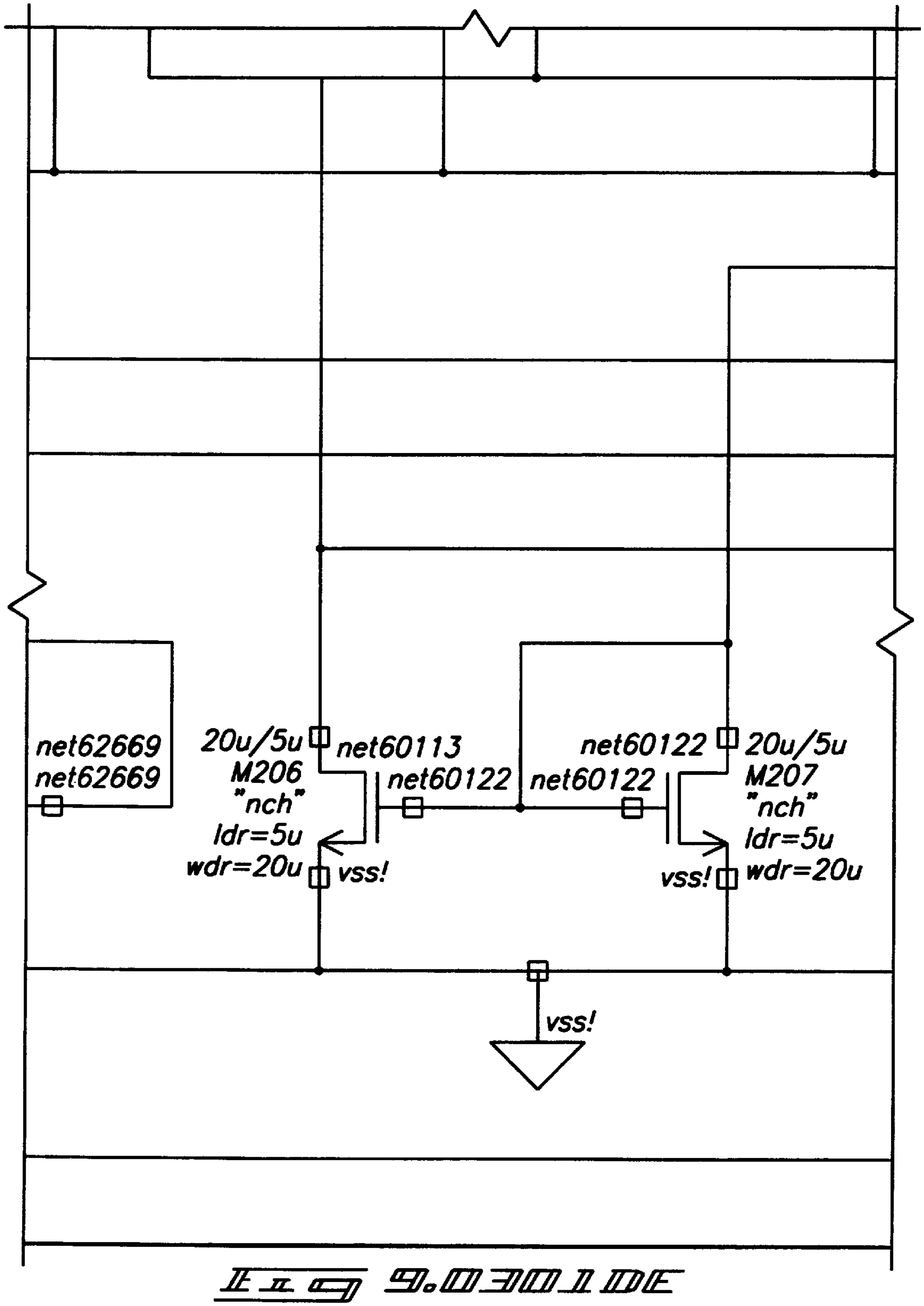
Fig 9.03013DE

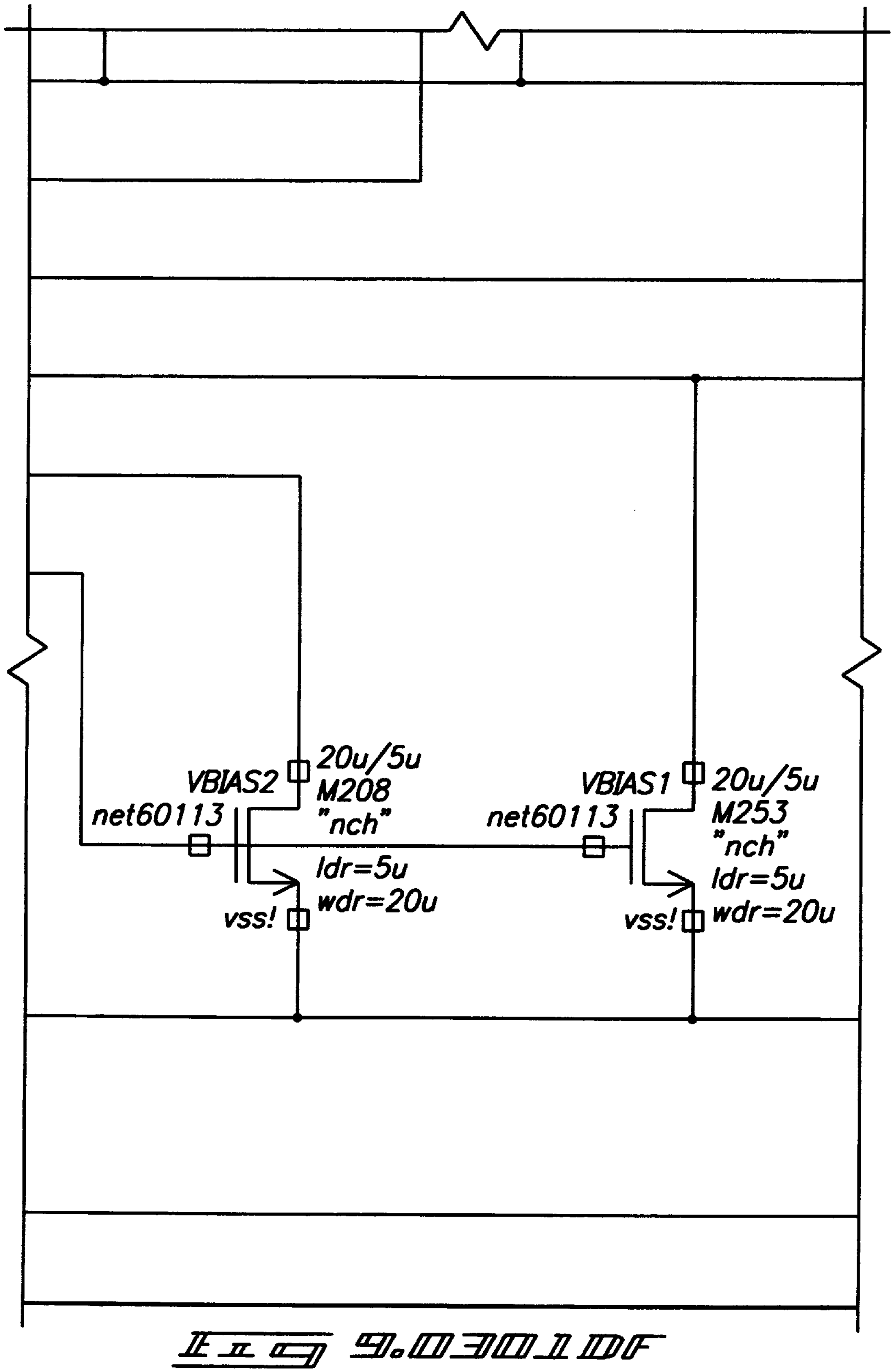
Fig. 9.03010F

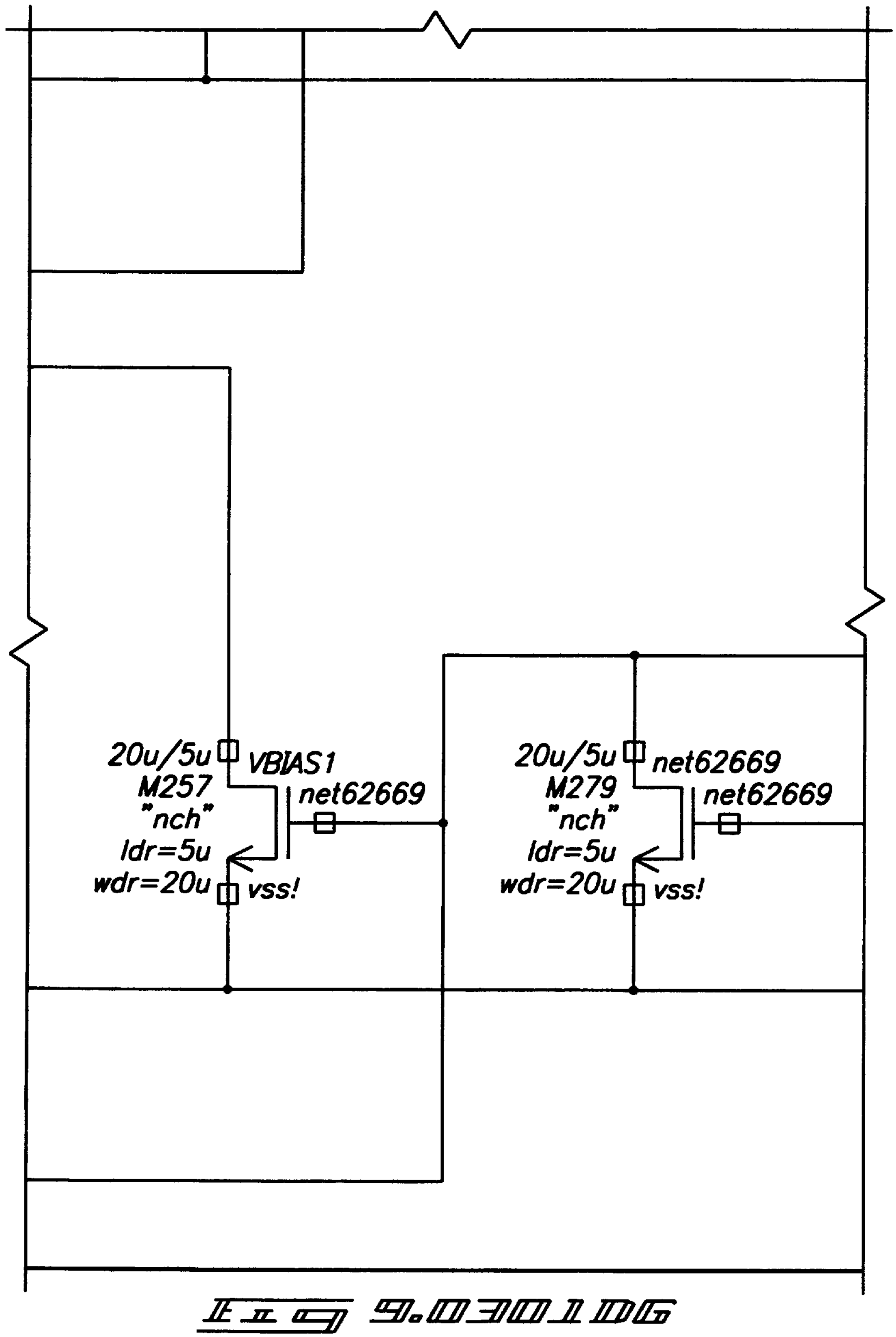
Fig 9.03O1DG

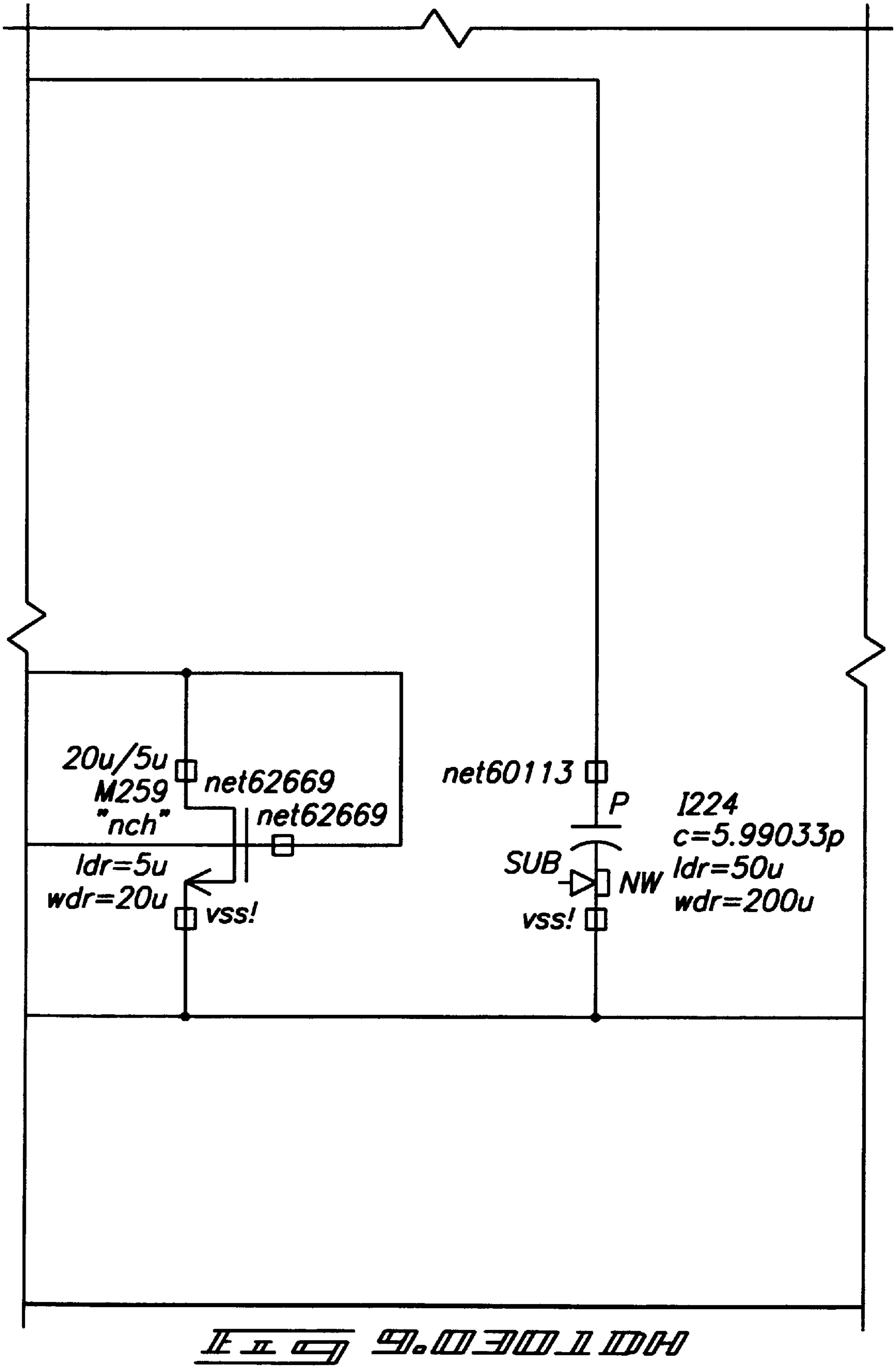
Fig 9.03.01DH

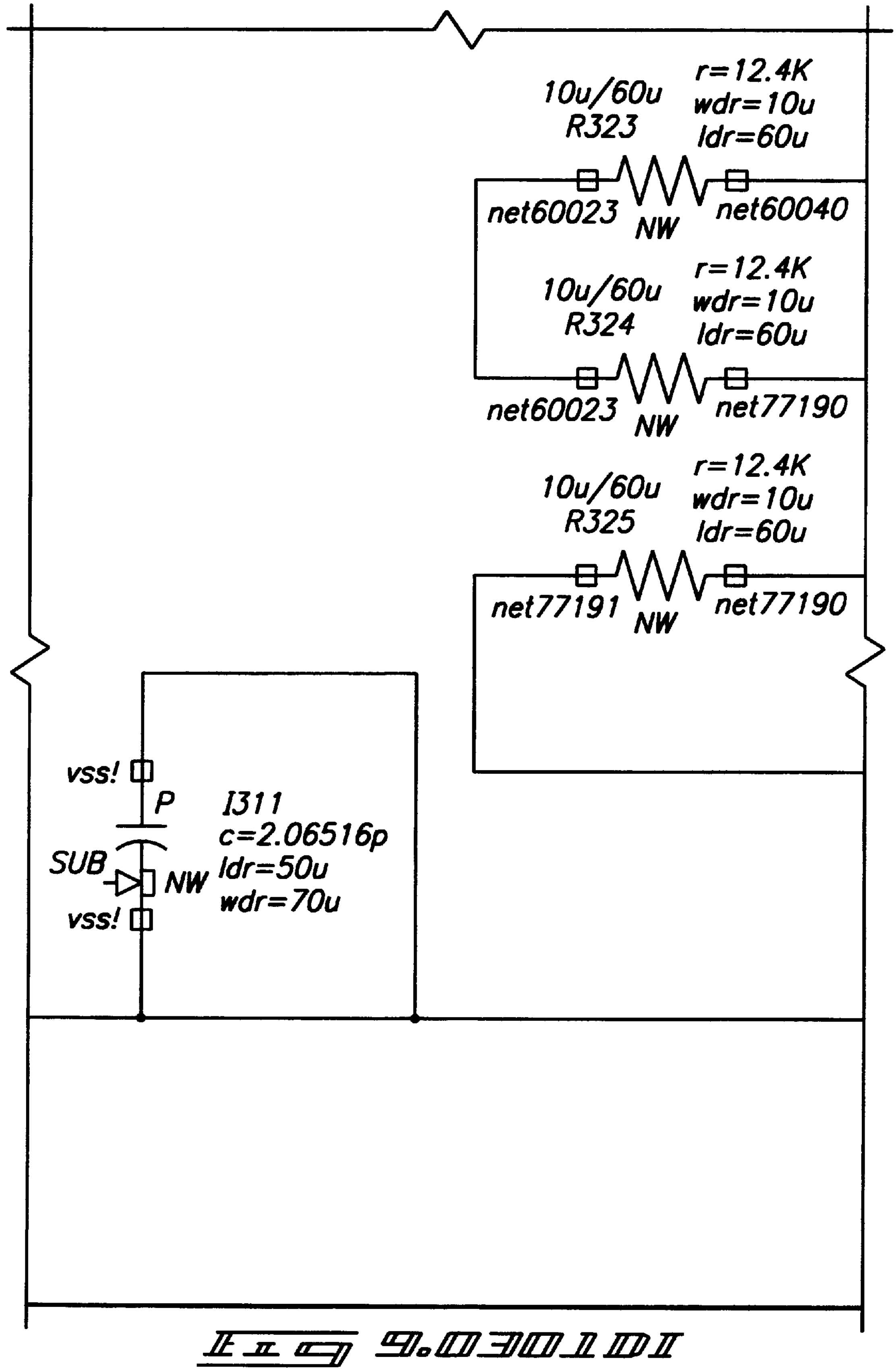
Fig 9.03011DI

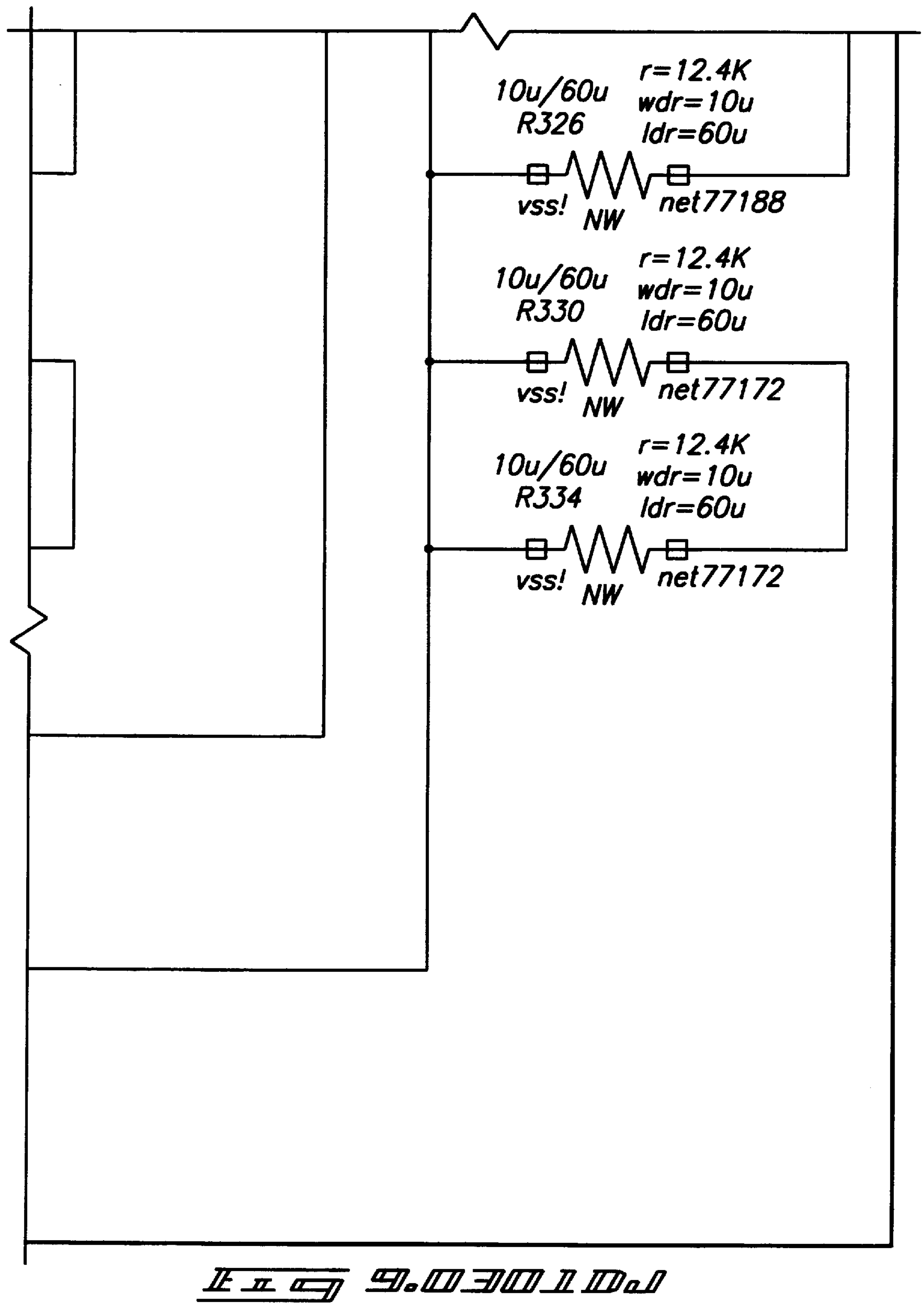
Fig 9.030.1D.1

| | | | | | | | | | |
|---|---|---|---|---|---|---|---|---|---|
| 9.0302AA | 9.0302AB | 9.0302AC | 9.0302AD | 9.0302AE | 9.0302AF | 9.0302AG | 9.0302AH | 9.0302AI | 9.0302AJ |
| 9.0302BA | 9.0302BB | 9.0302BC | 9.0302BD | 9.0302BE | 9.0302BF | 9.0302BG | 9.0302BH | 9.0302BI | 9.0302BJ |
| | | 9.0302CC | 9.0302CD | 9.0302CE | 9.0302CF | 9.0302CG | 9.0302CH | 9.0302CI | 9.0302CJ |
| | | | | | | 9.0302DG | 9.0302DH | 9.0302DI | |

FIG. 9.0302

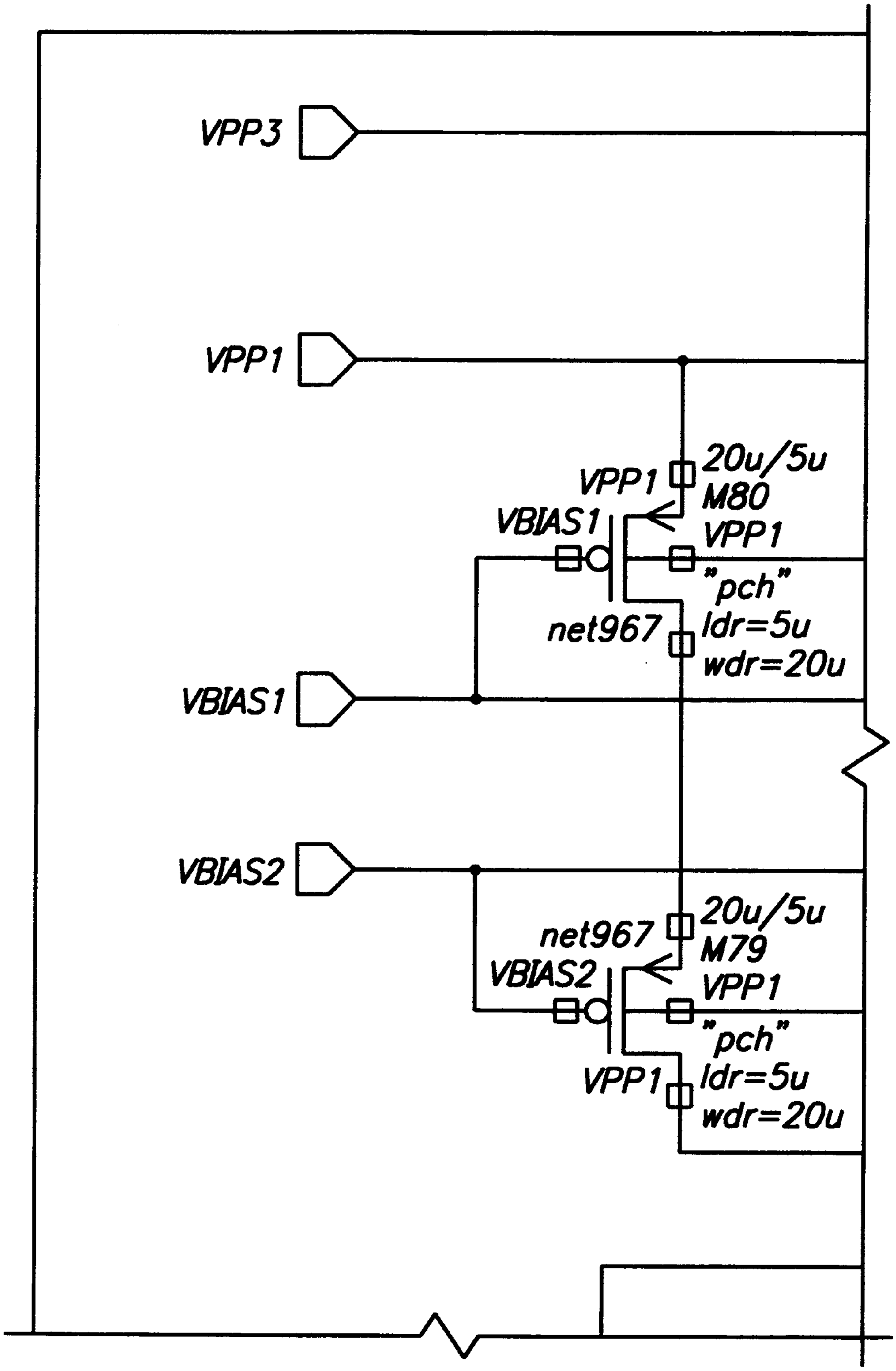
Fig 9.0302AA

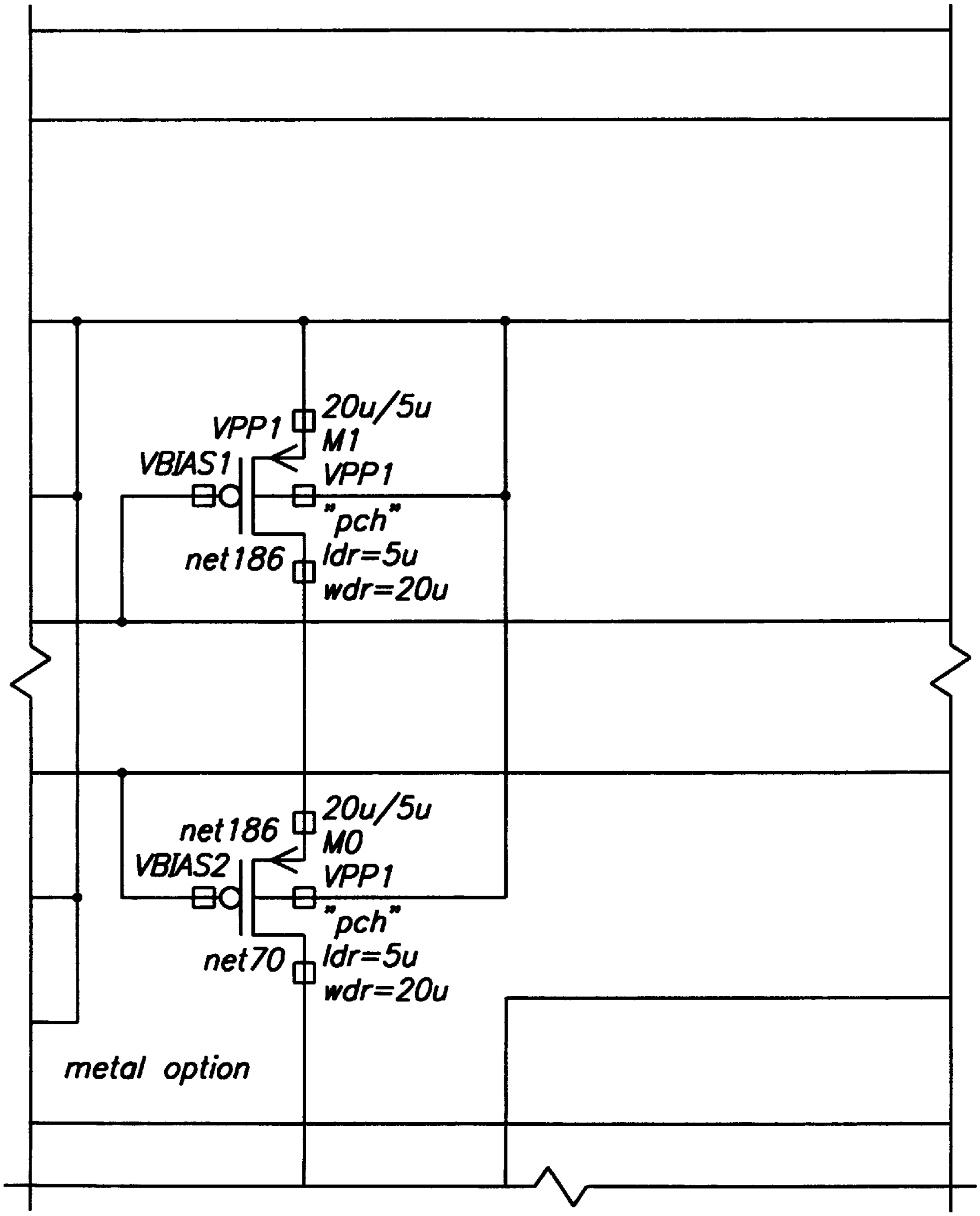
Fig 9.0302AB

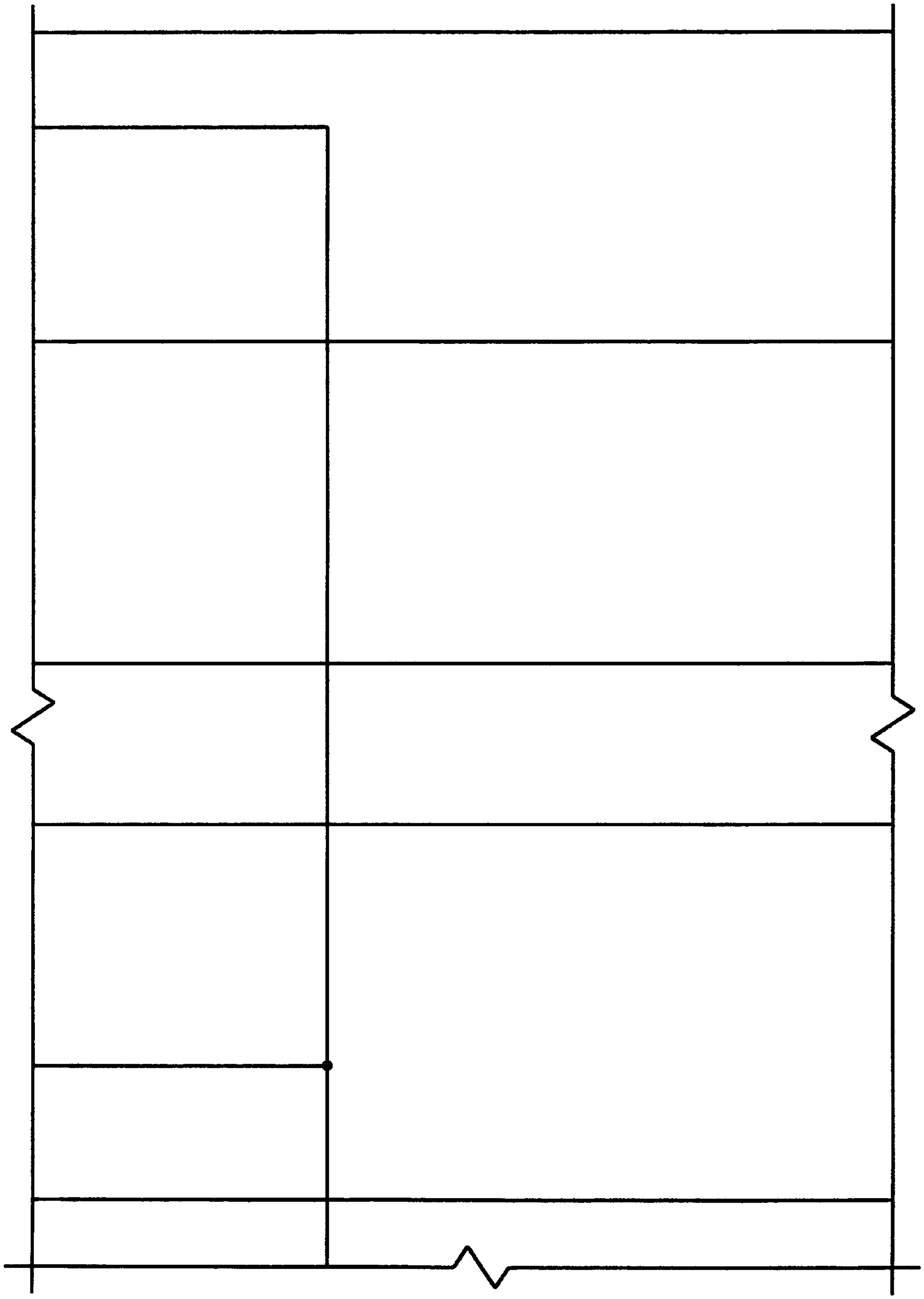
Fig 9.0302AC

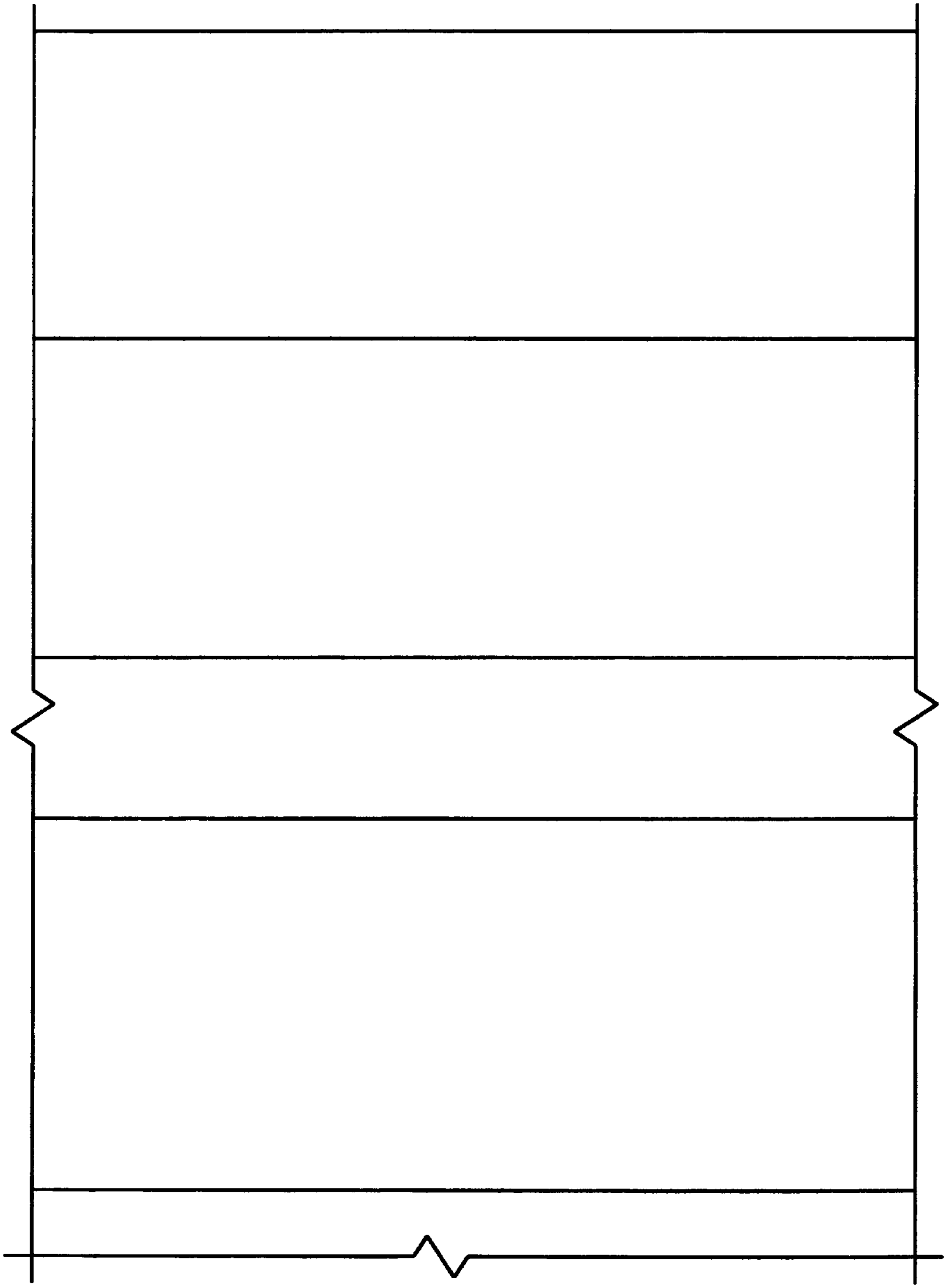
Fig. 9.0302AD

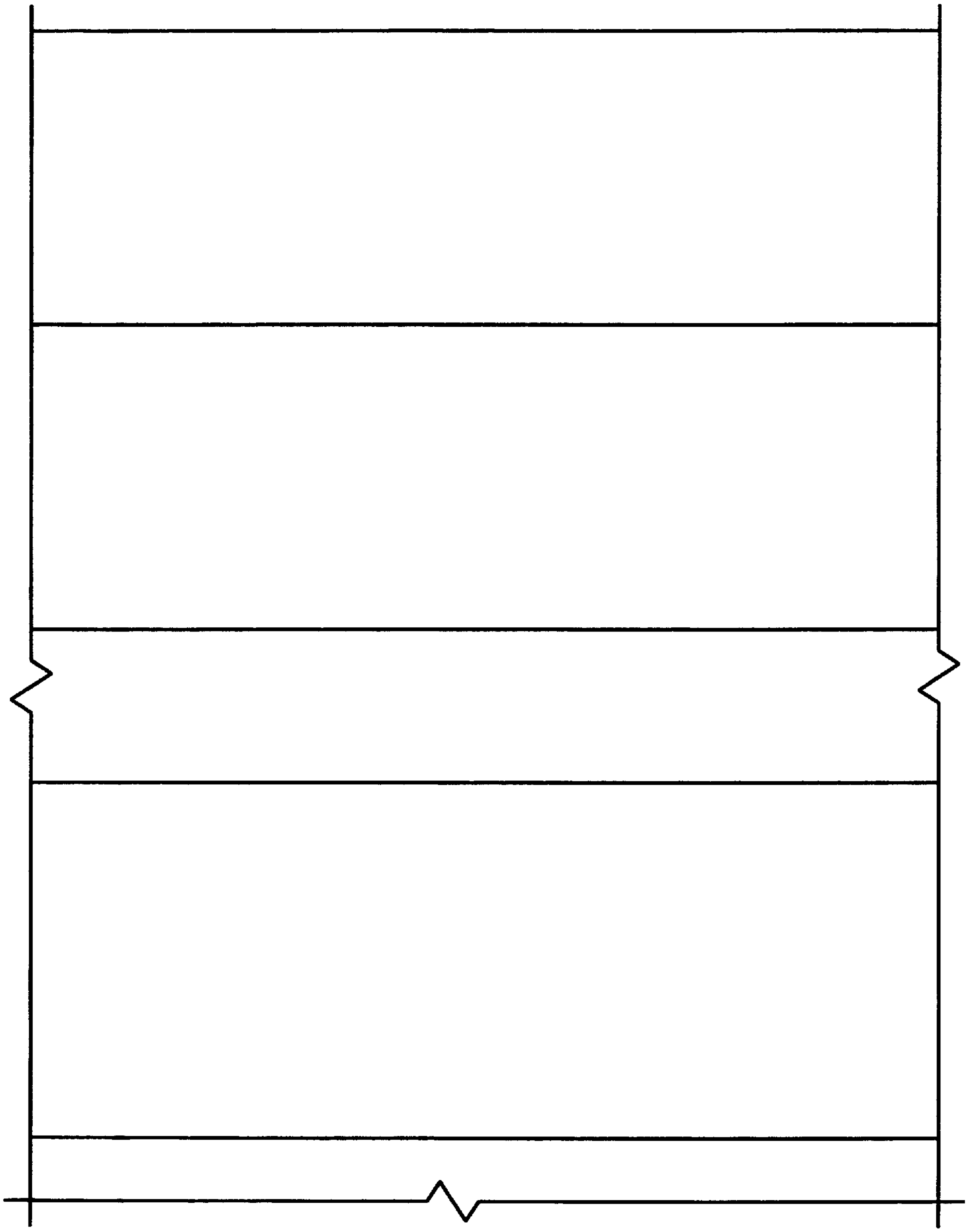
Fig 9.0302AE

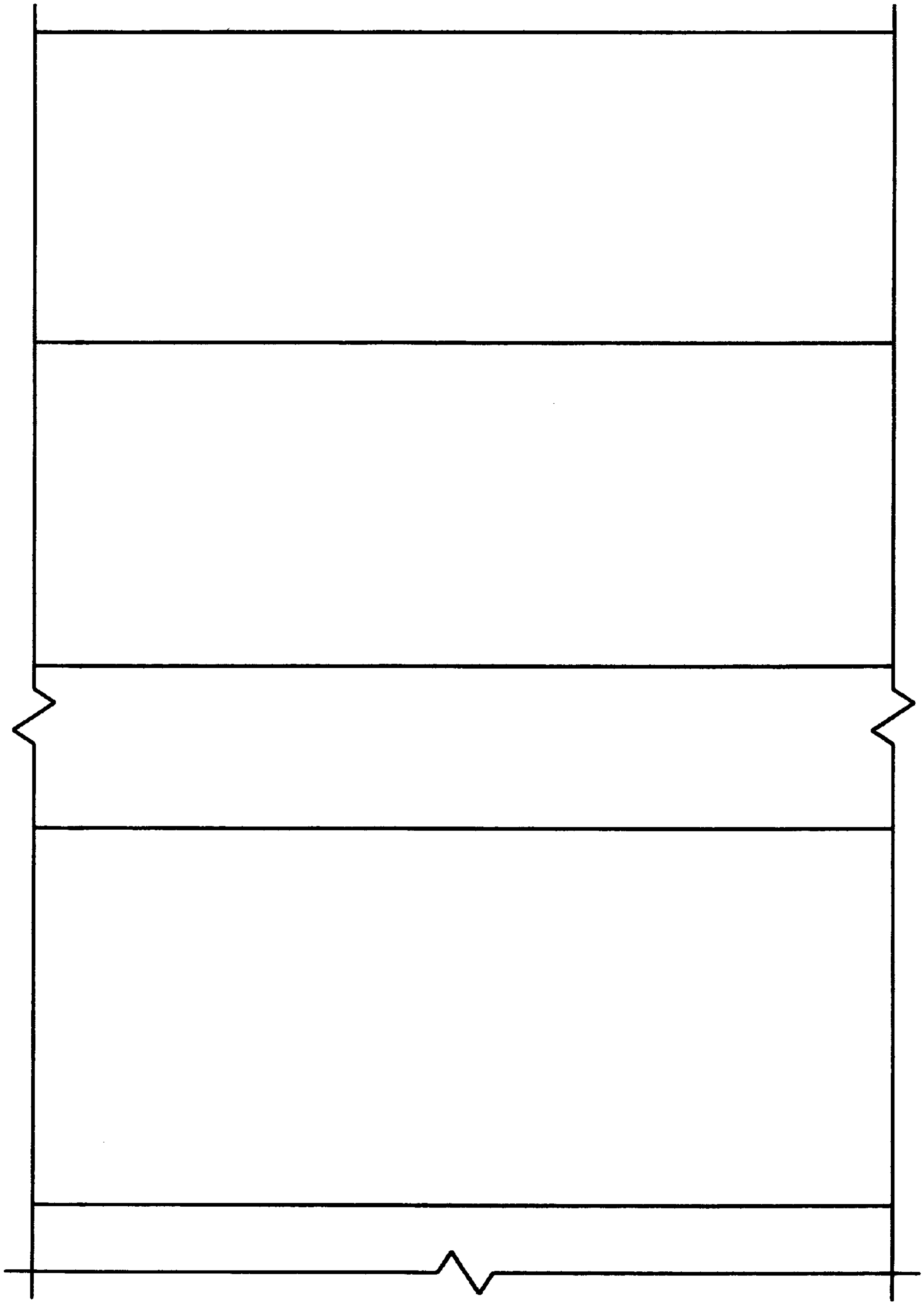
Fig 9.0302AF

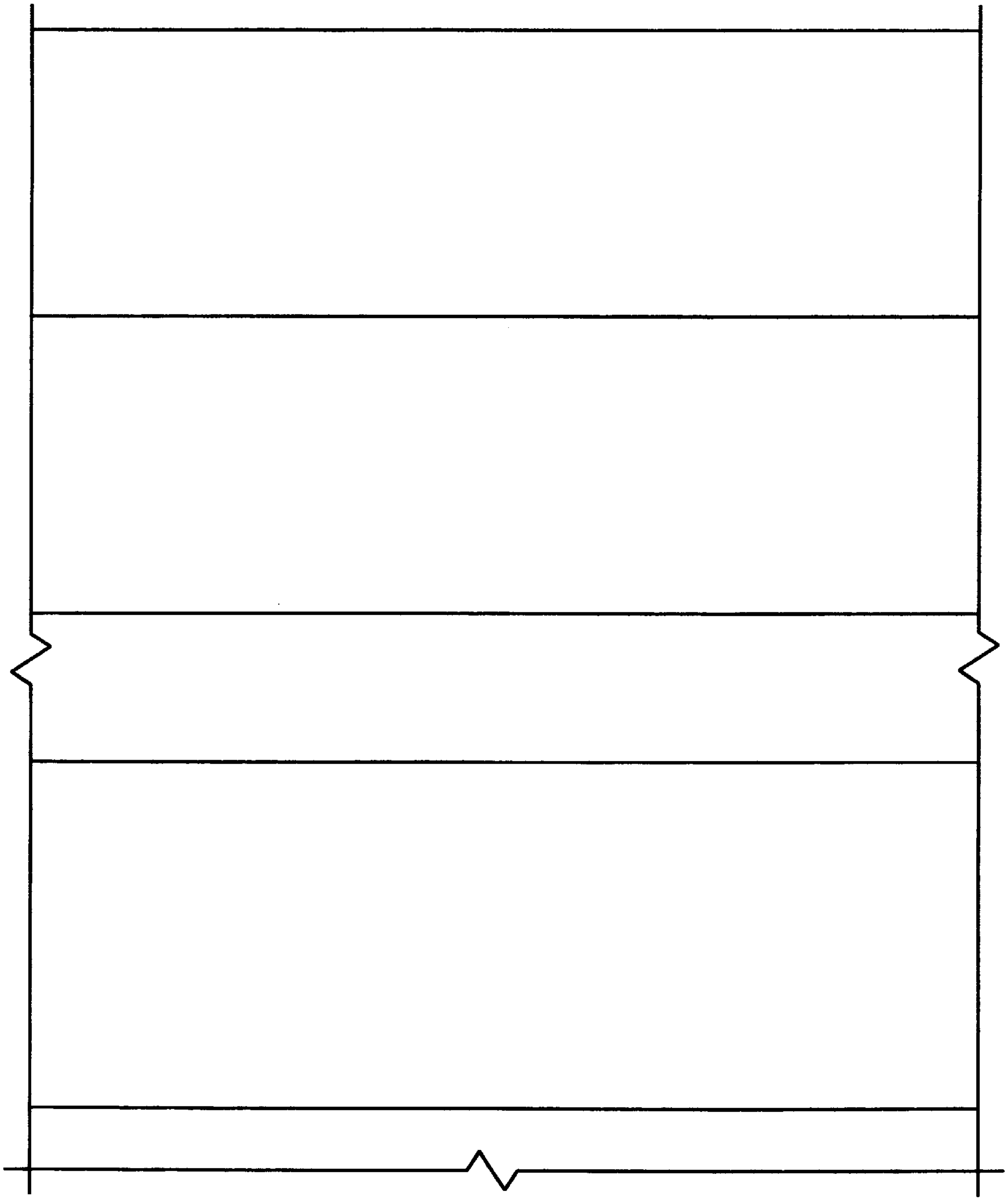
Fig 9.0302AG

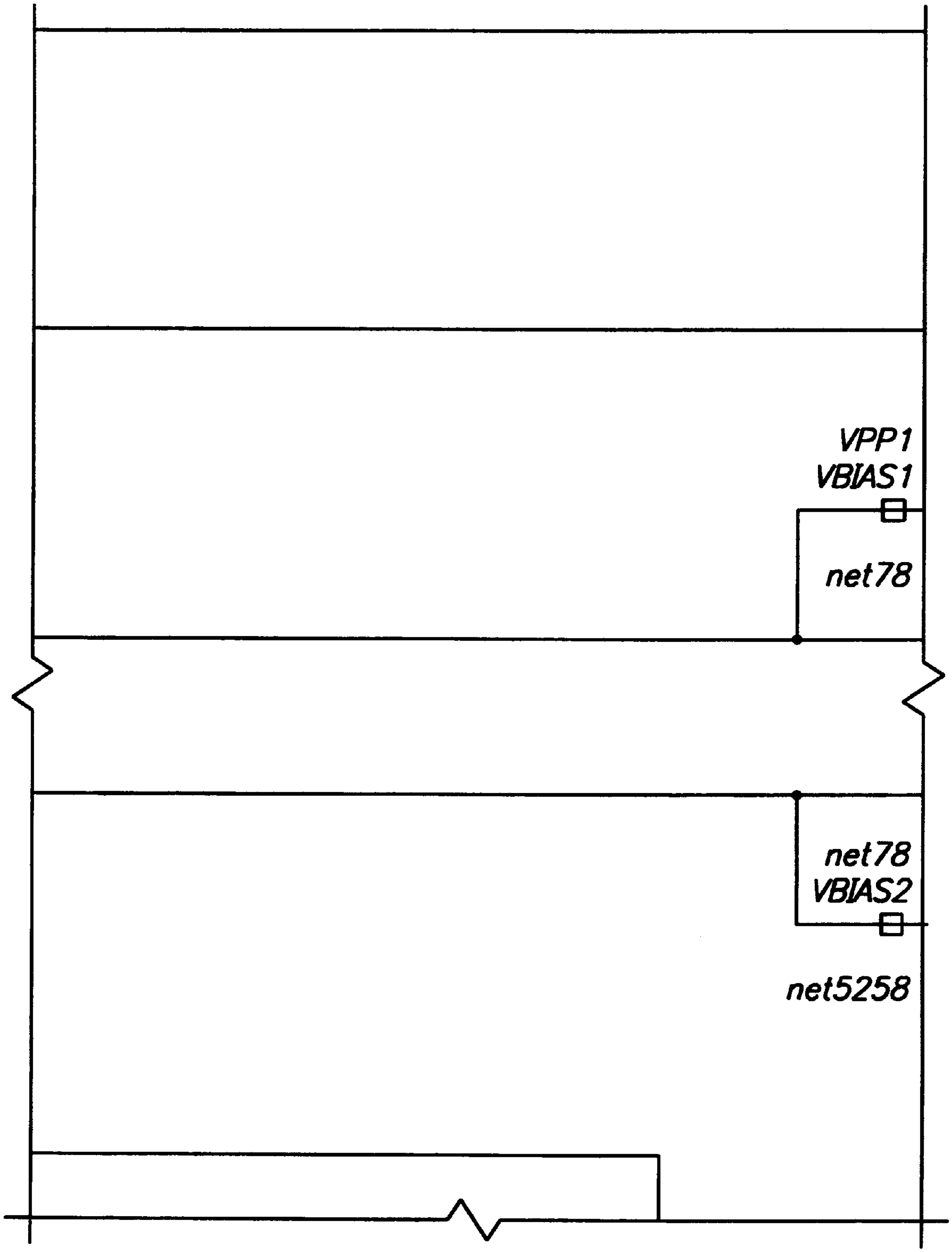
Fig 9.0302AH

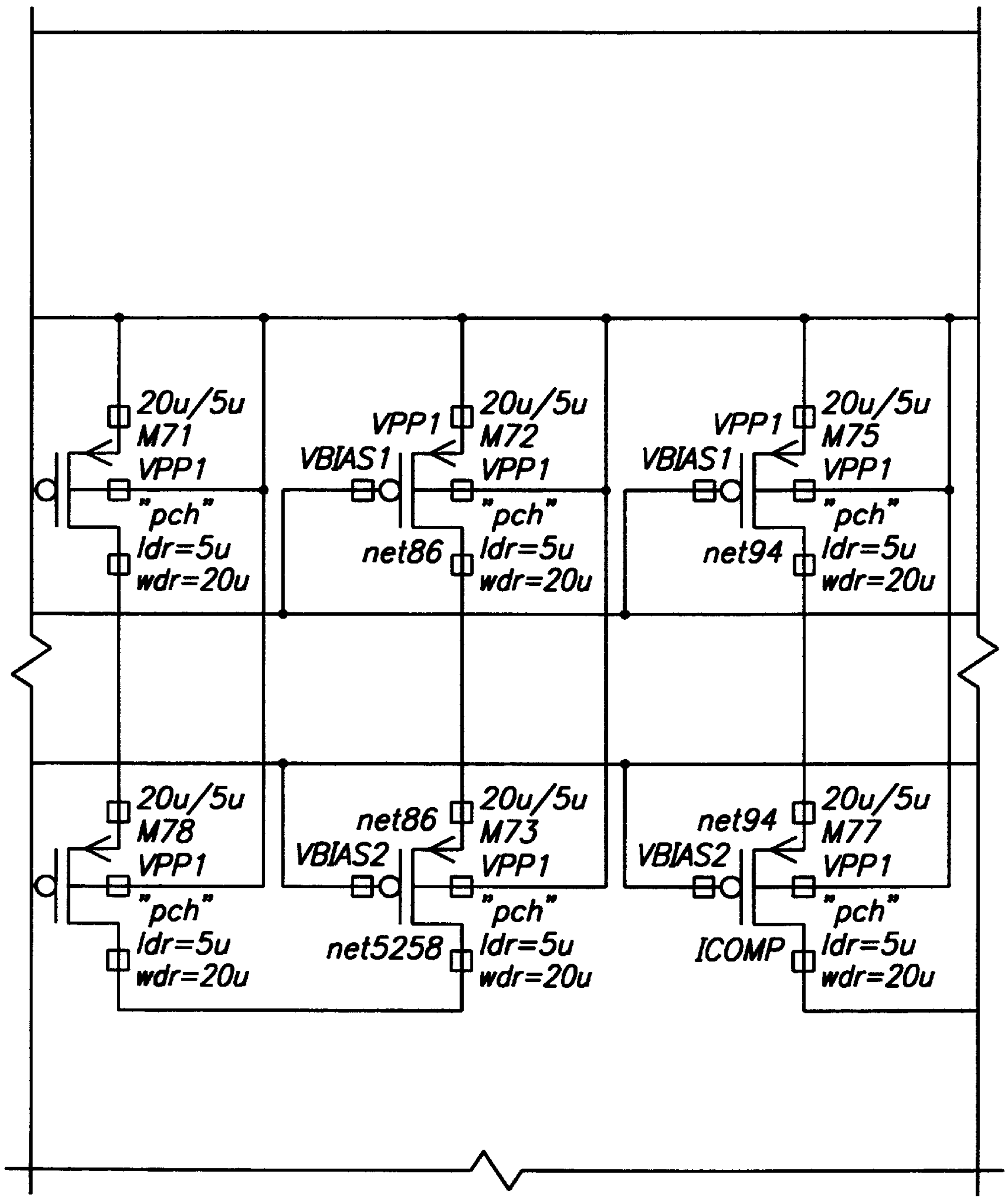
Fig 9.0302AI

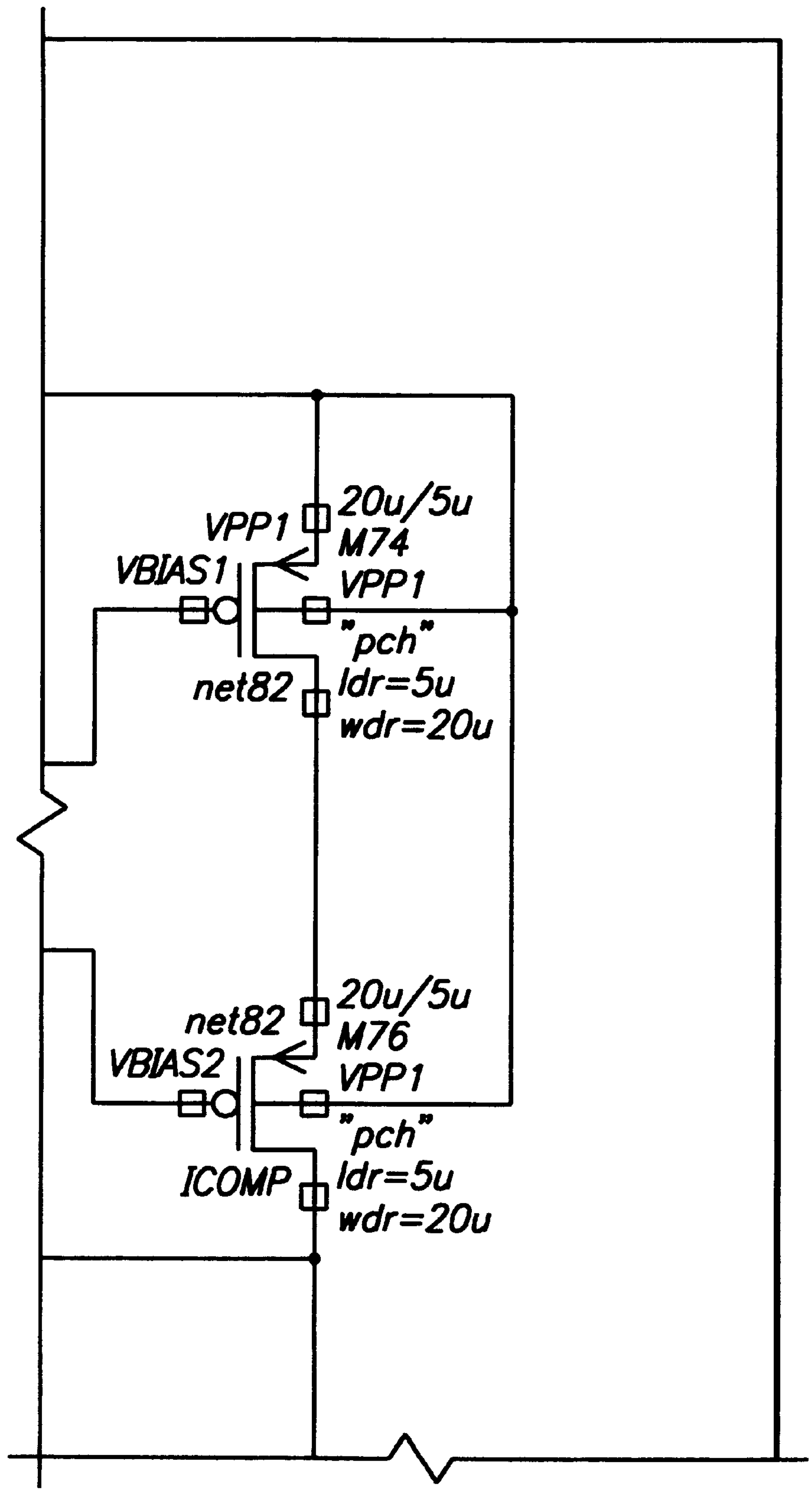
Fig 9.0302AJ

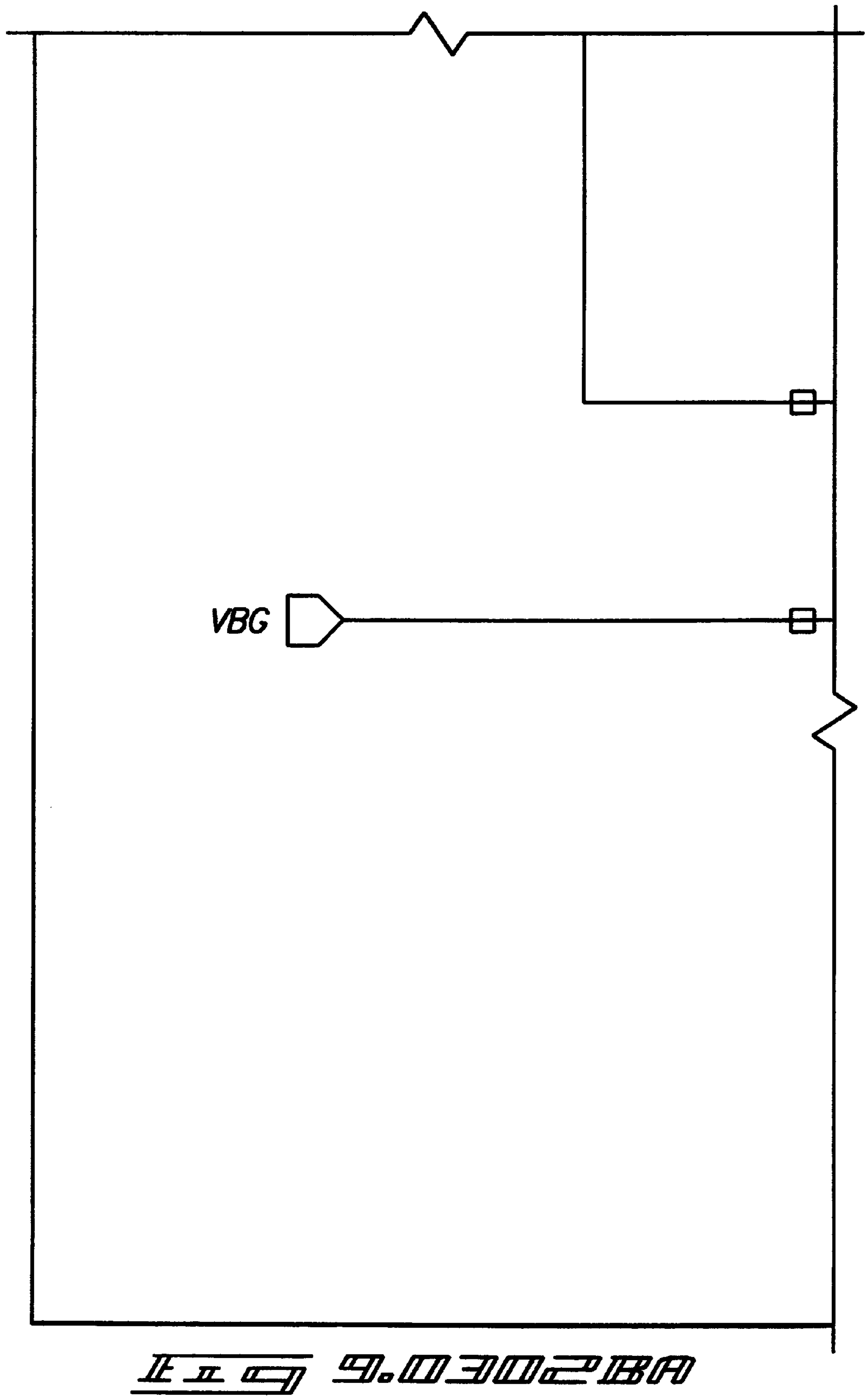
Fig 9.0302BA

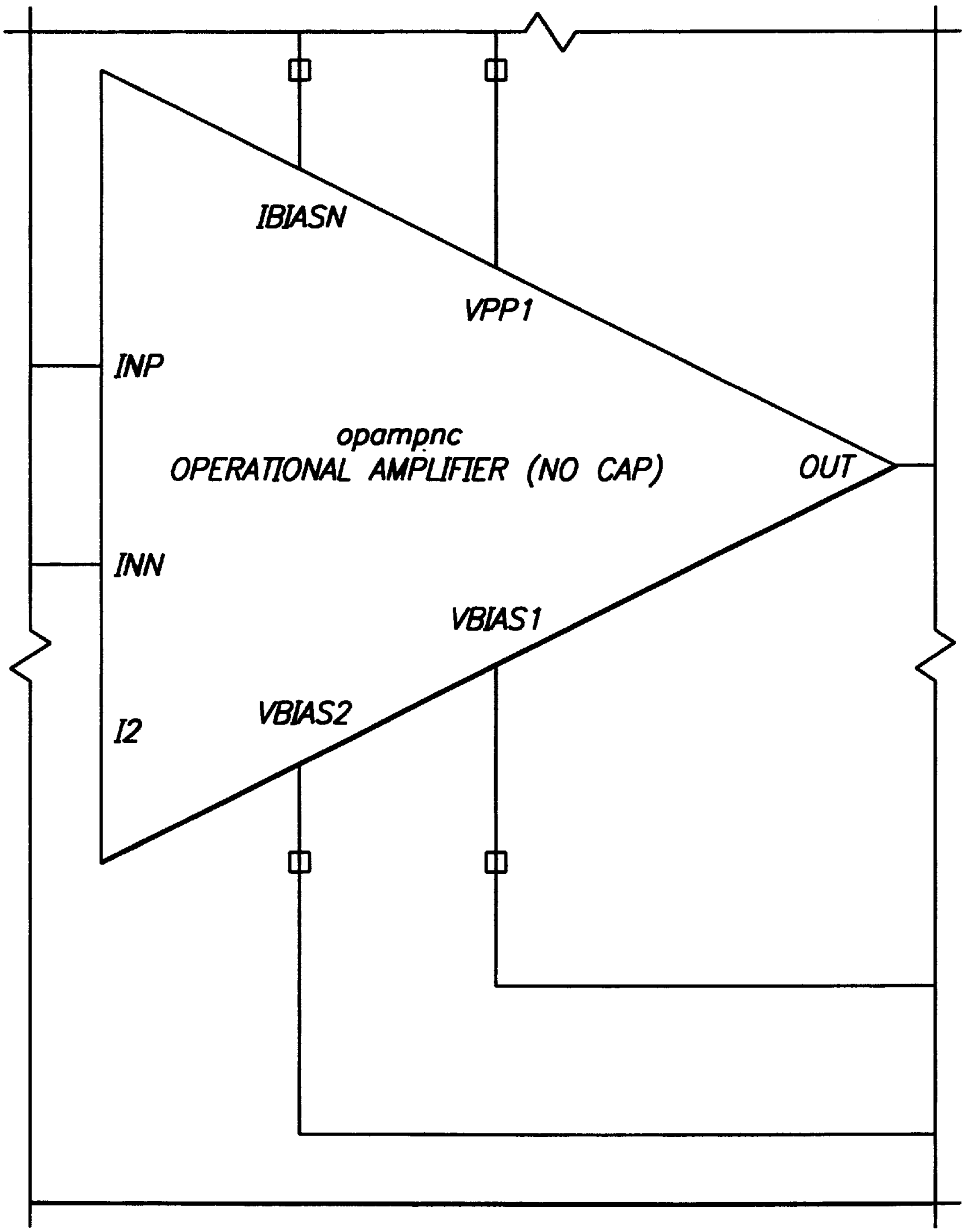
FIG 9.0302BB

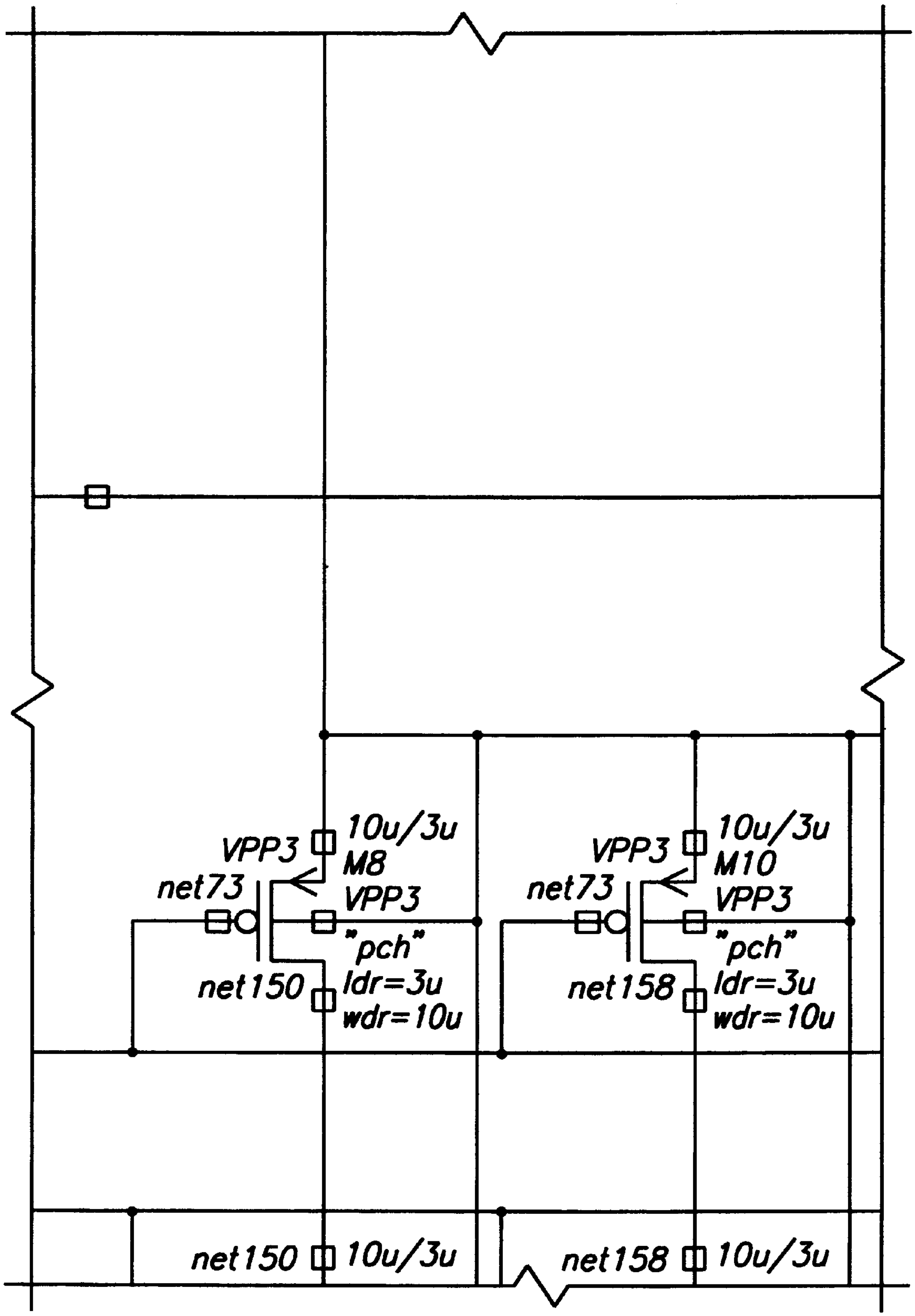
Fig 9.0302BC

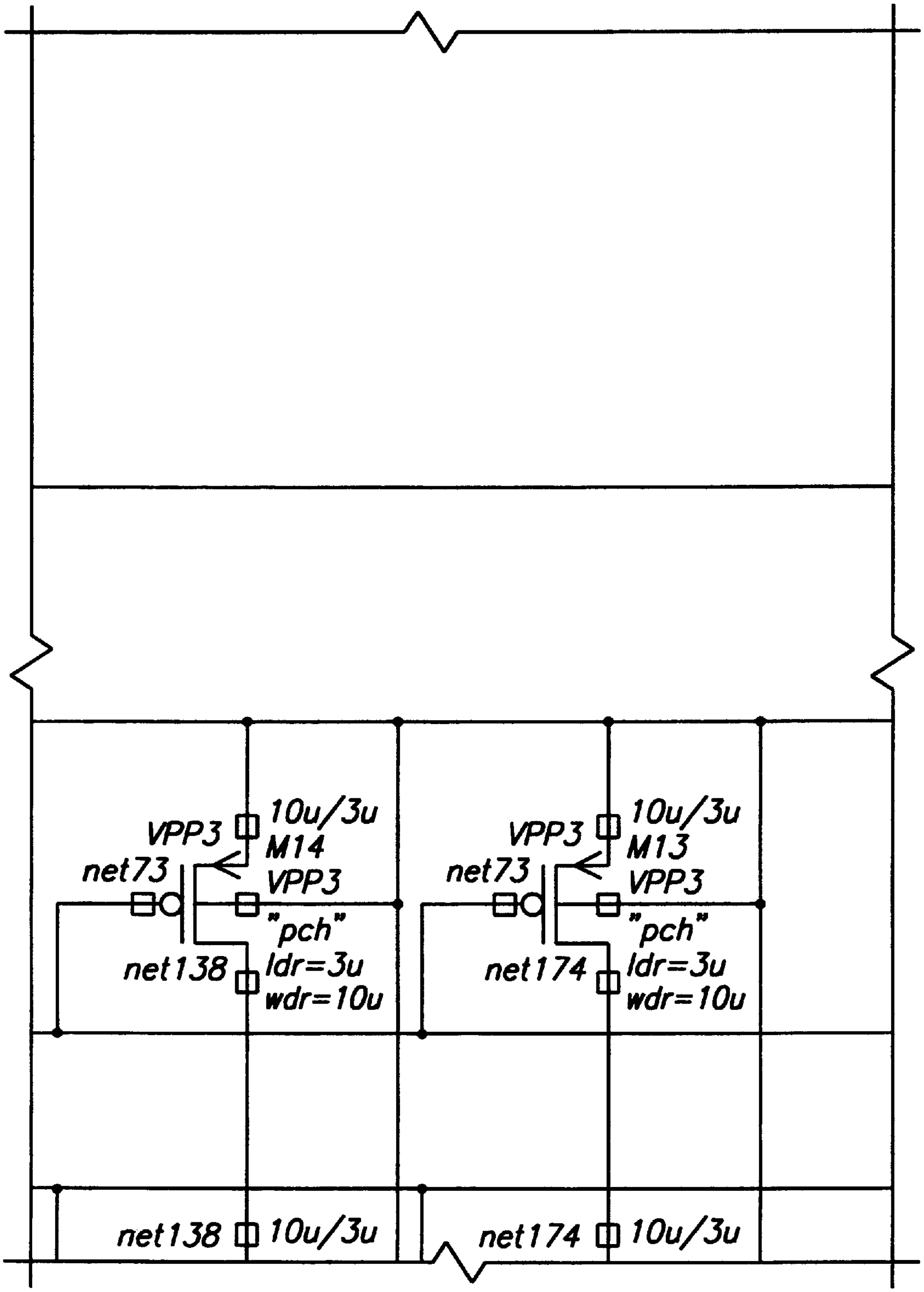
Fig 9.0302BD

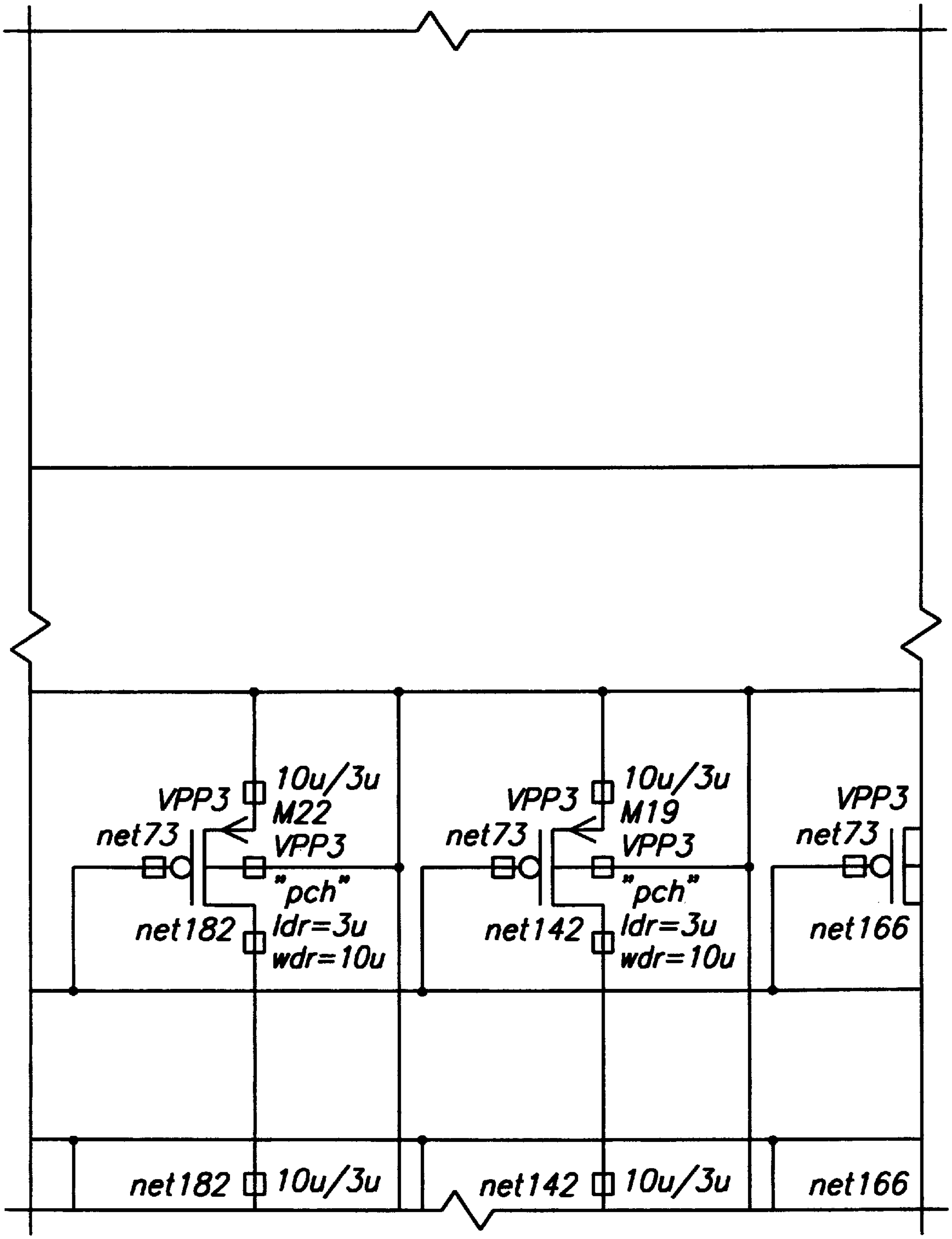
Fig 9.0302BE

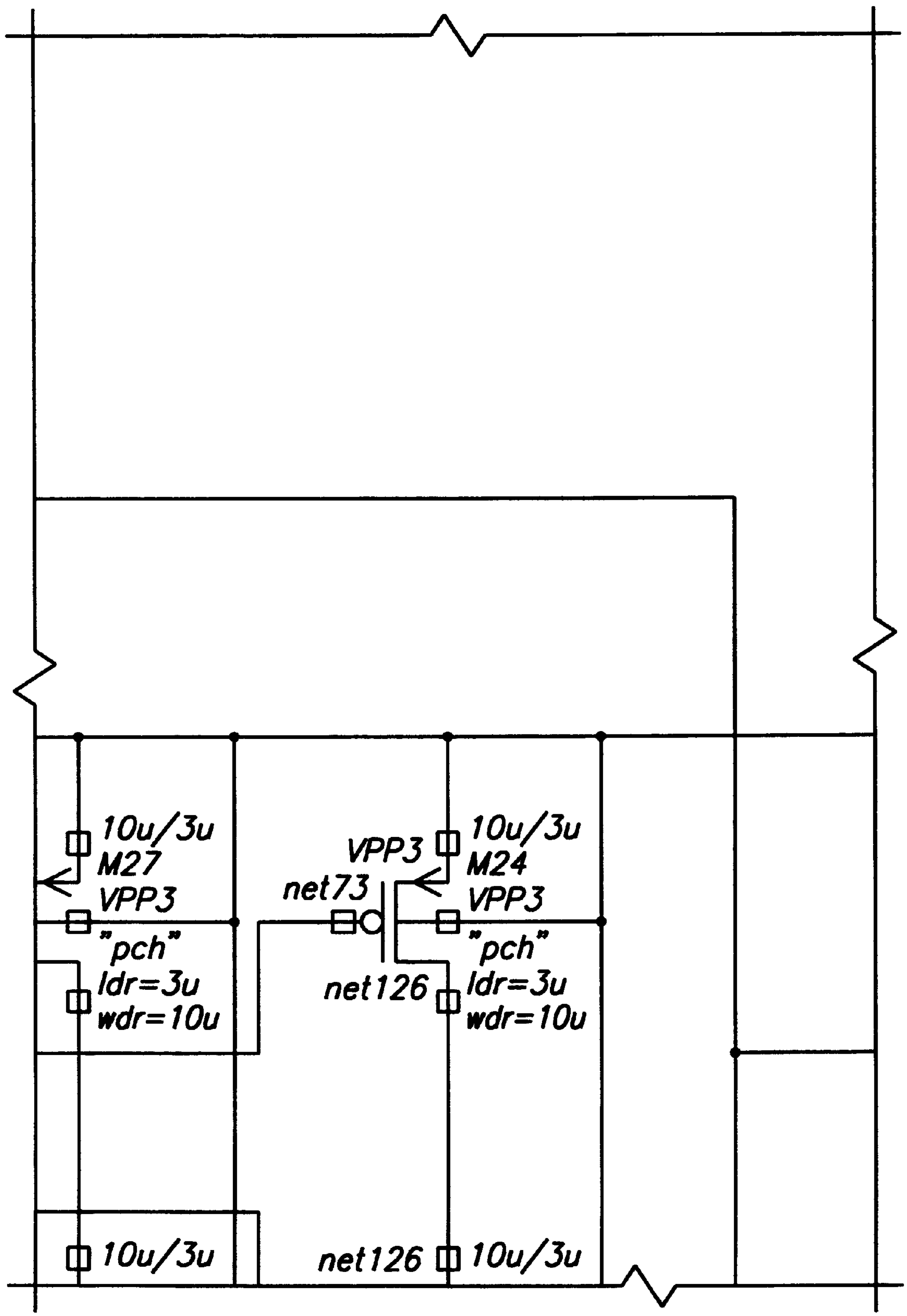
Fig 9.0302BF

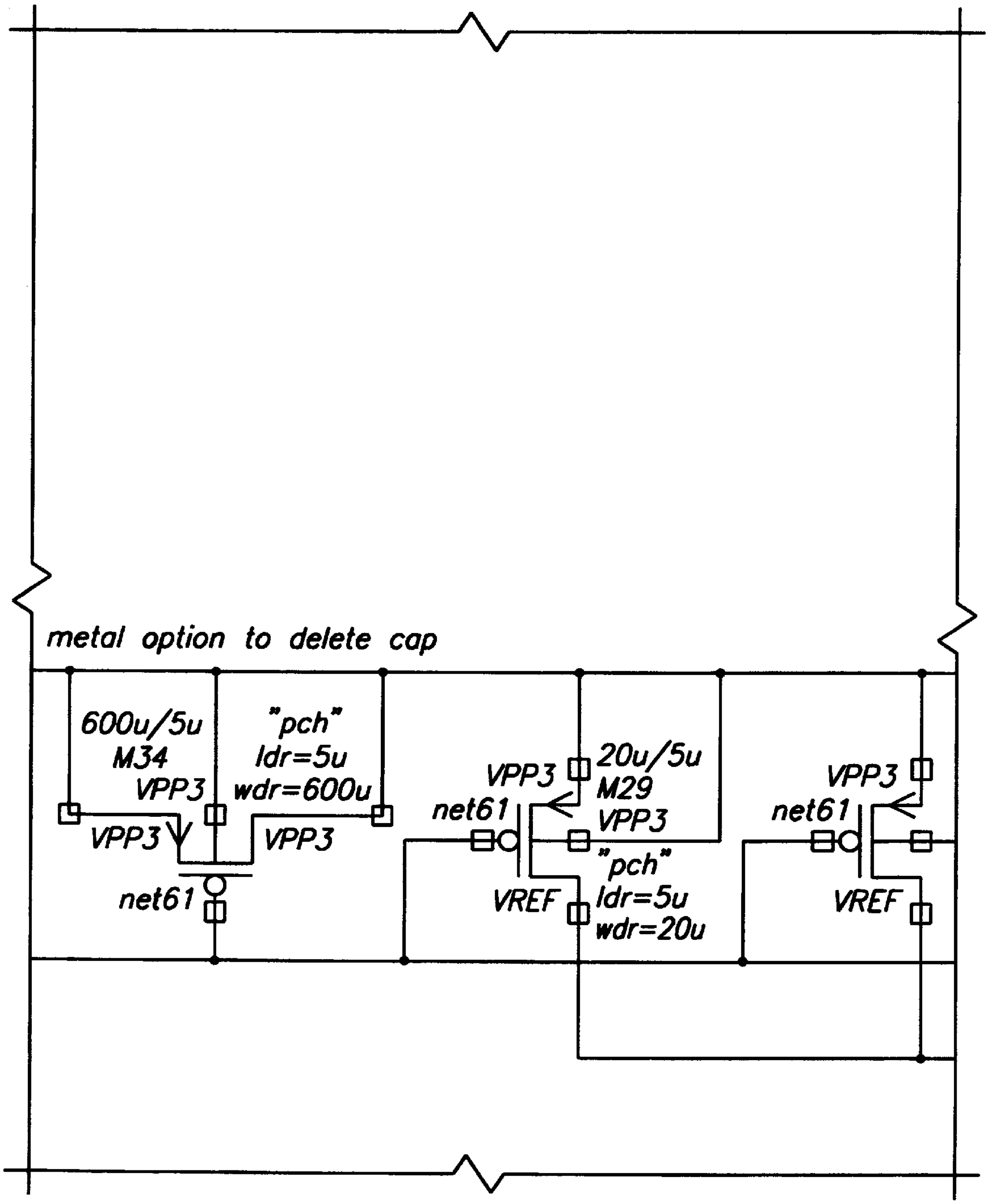
Fig 9.0302BG

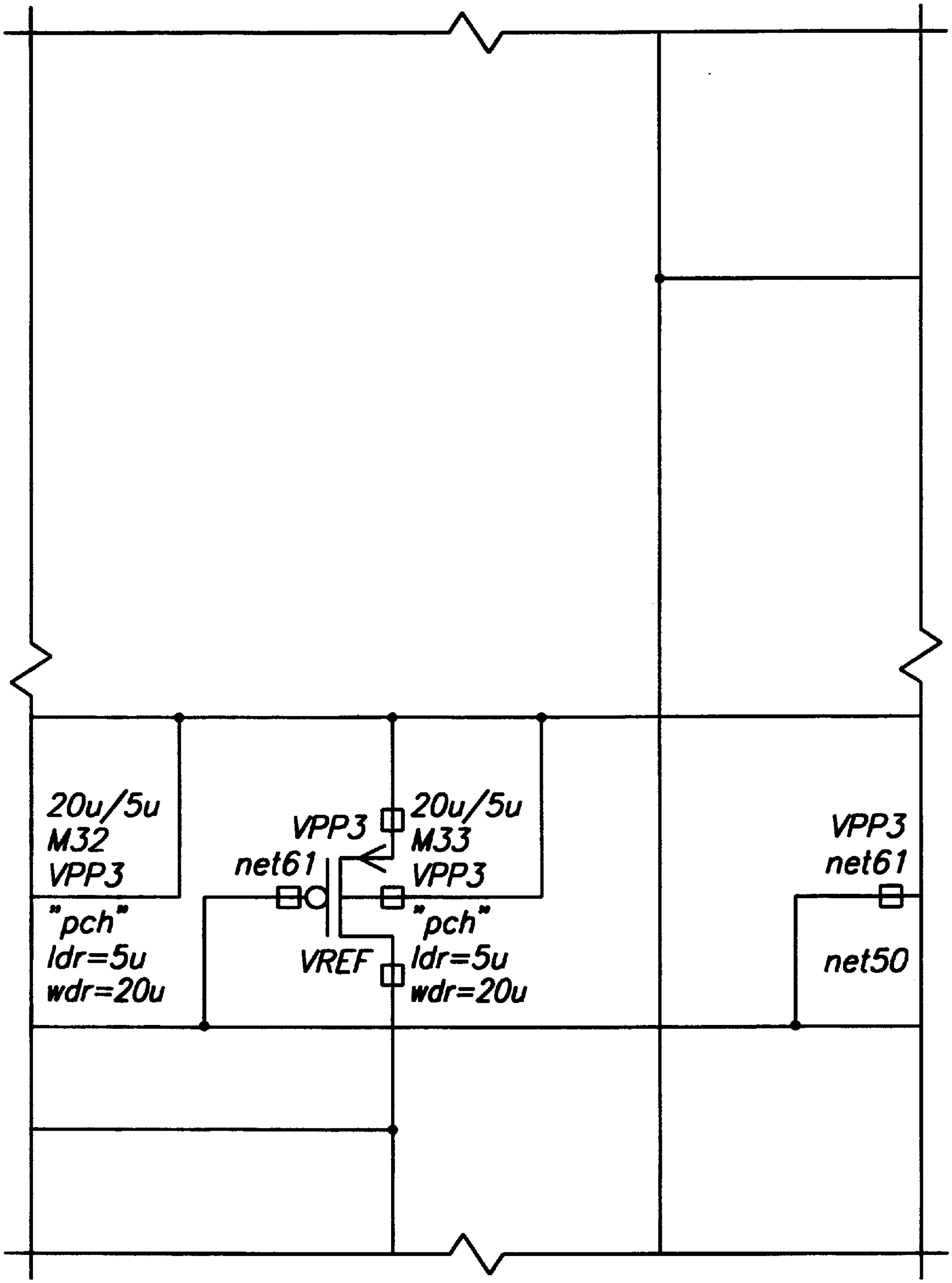
FIG 9.0302BH

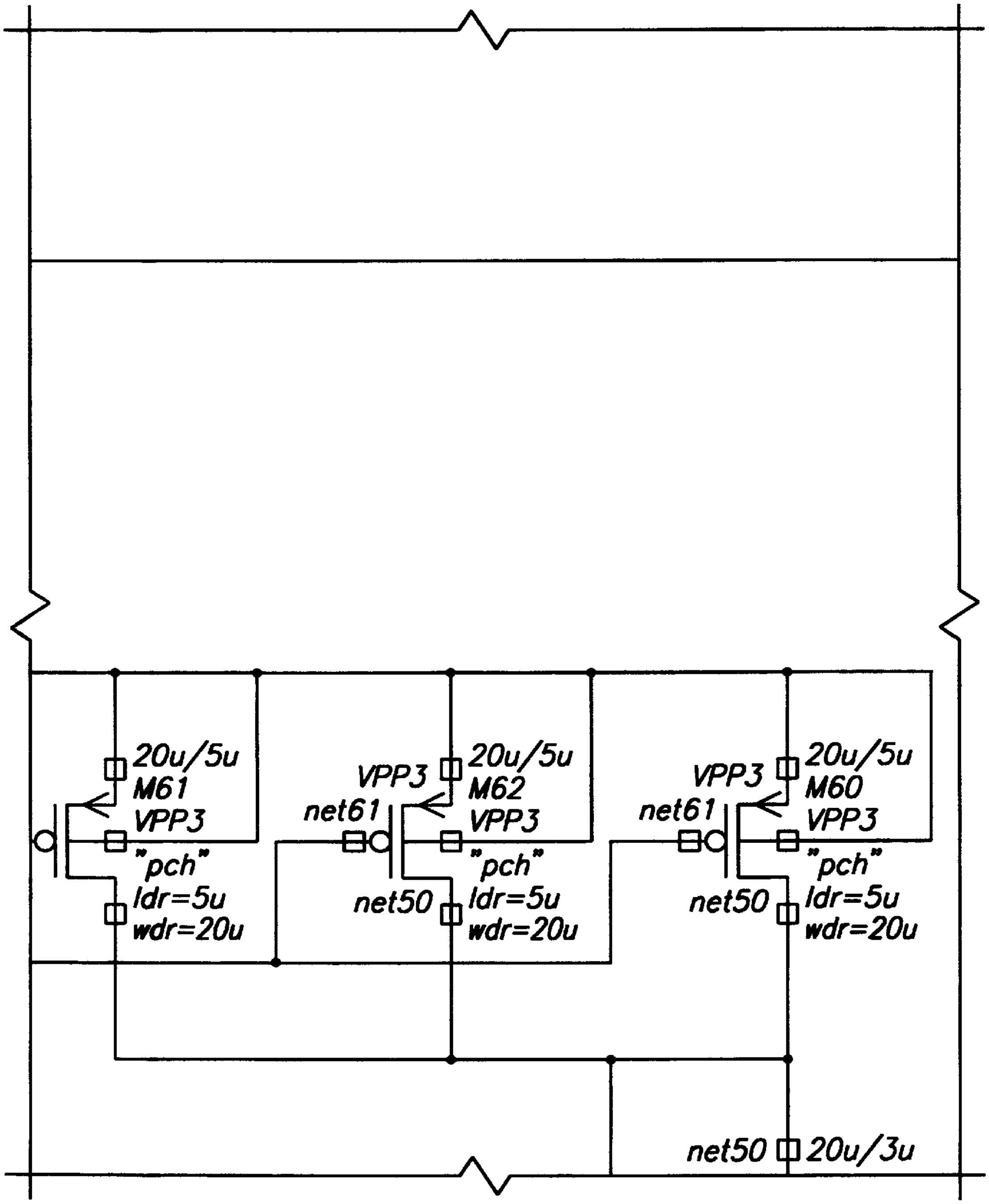
FIG 9.03028II

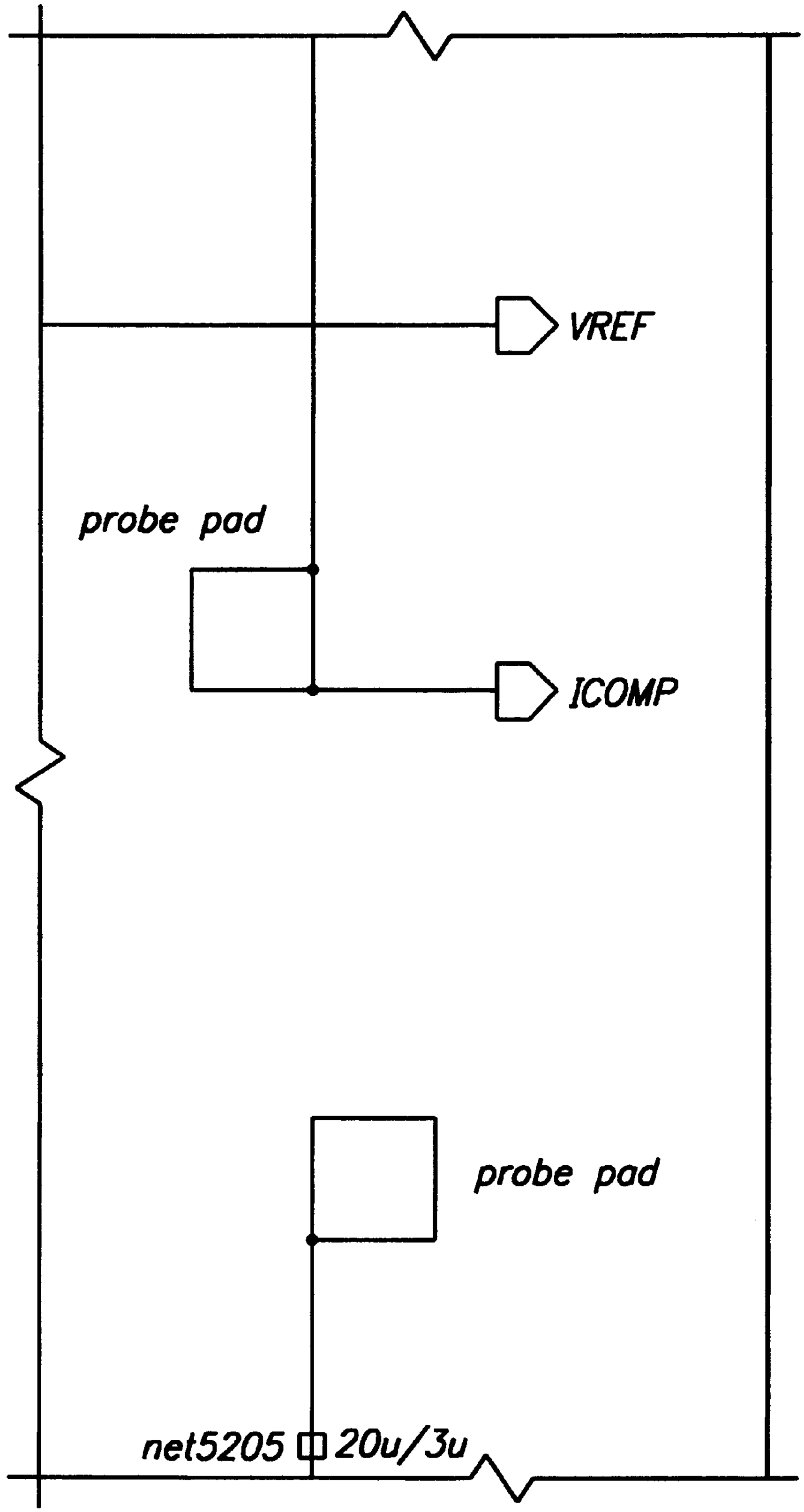
Fig 9.0302Bd

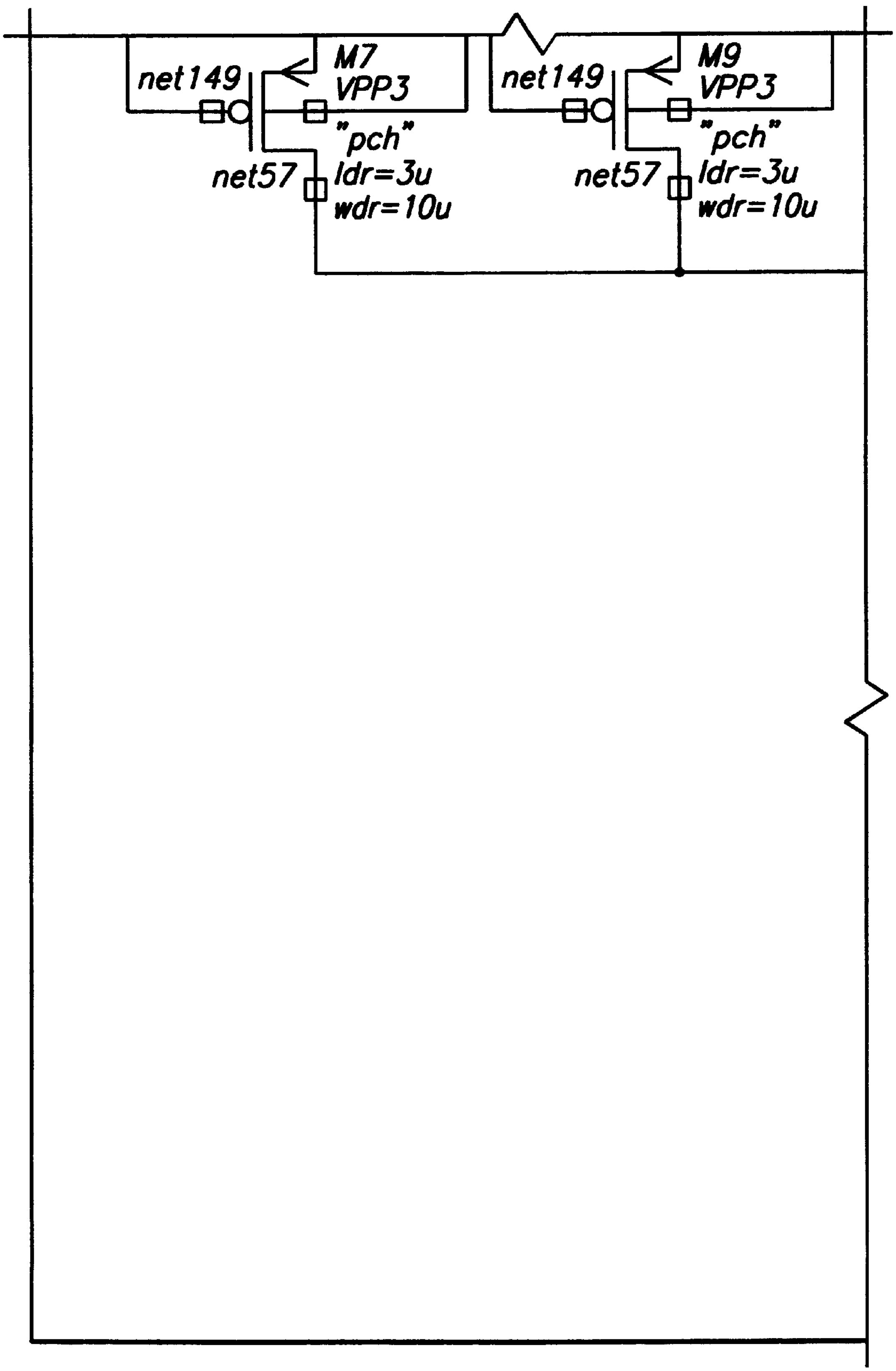
Fig 9.0302CC

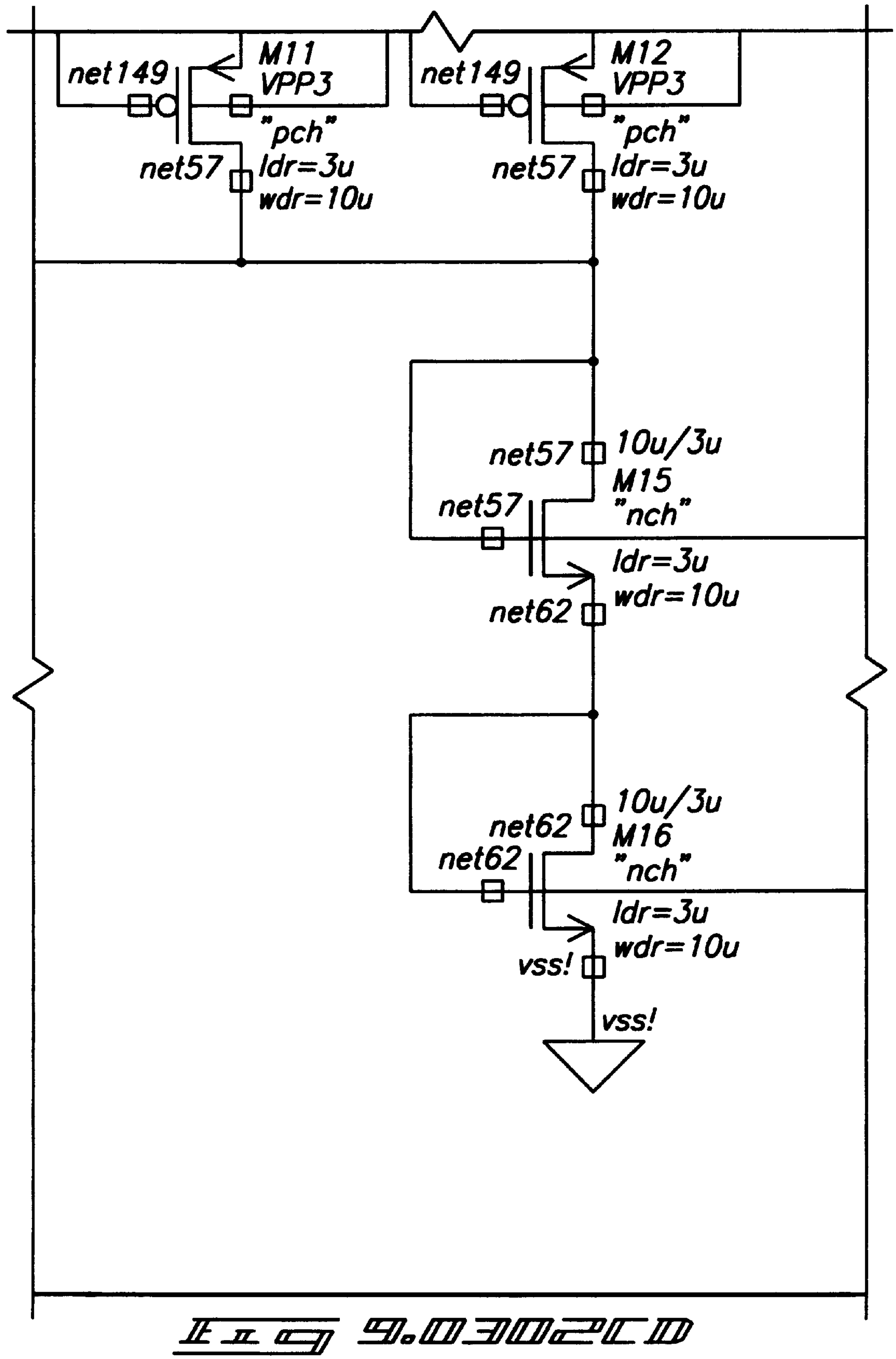
FIG 9.0302CD

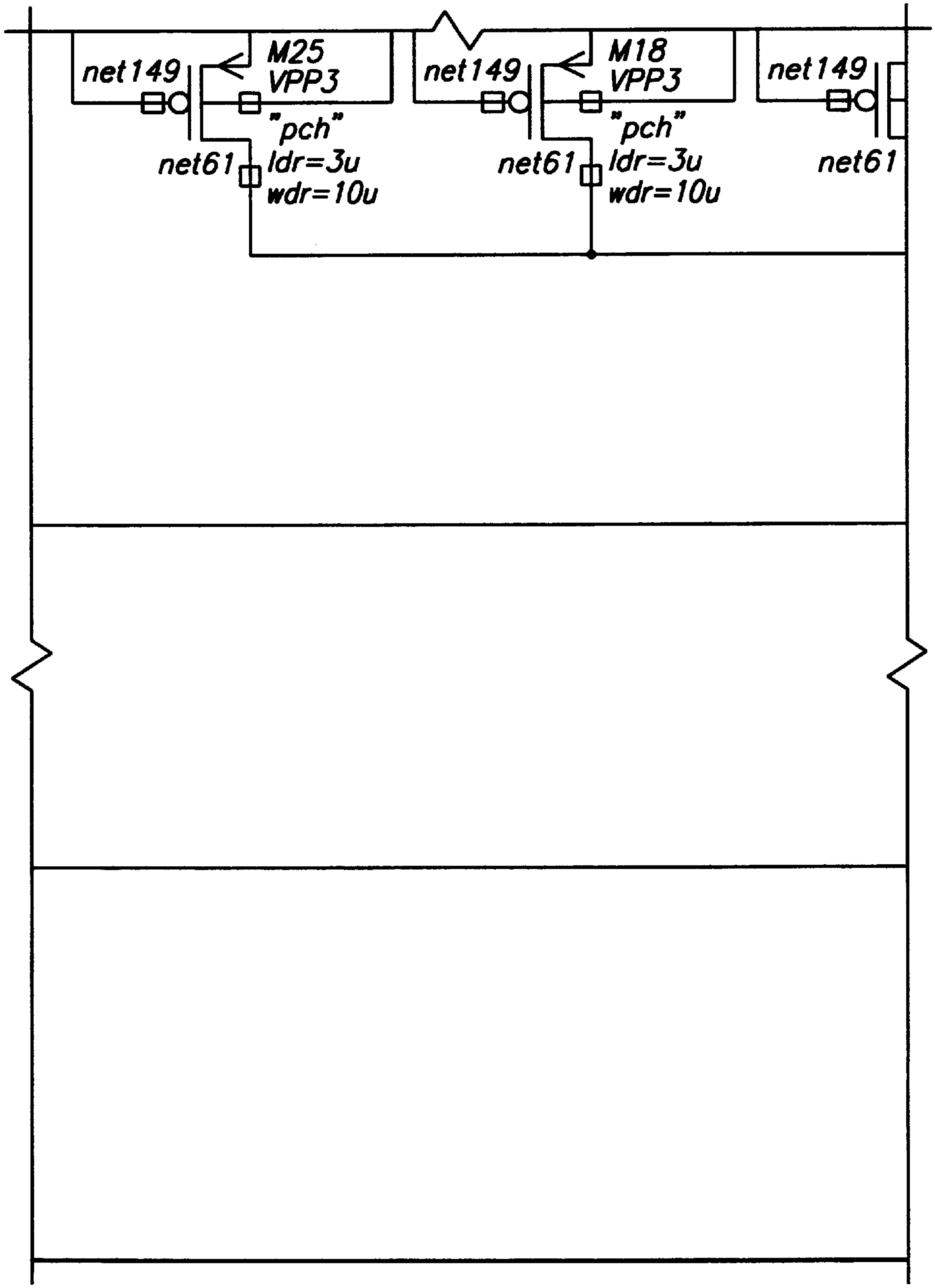
Fig 9.0302CE

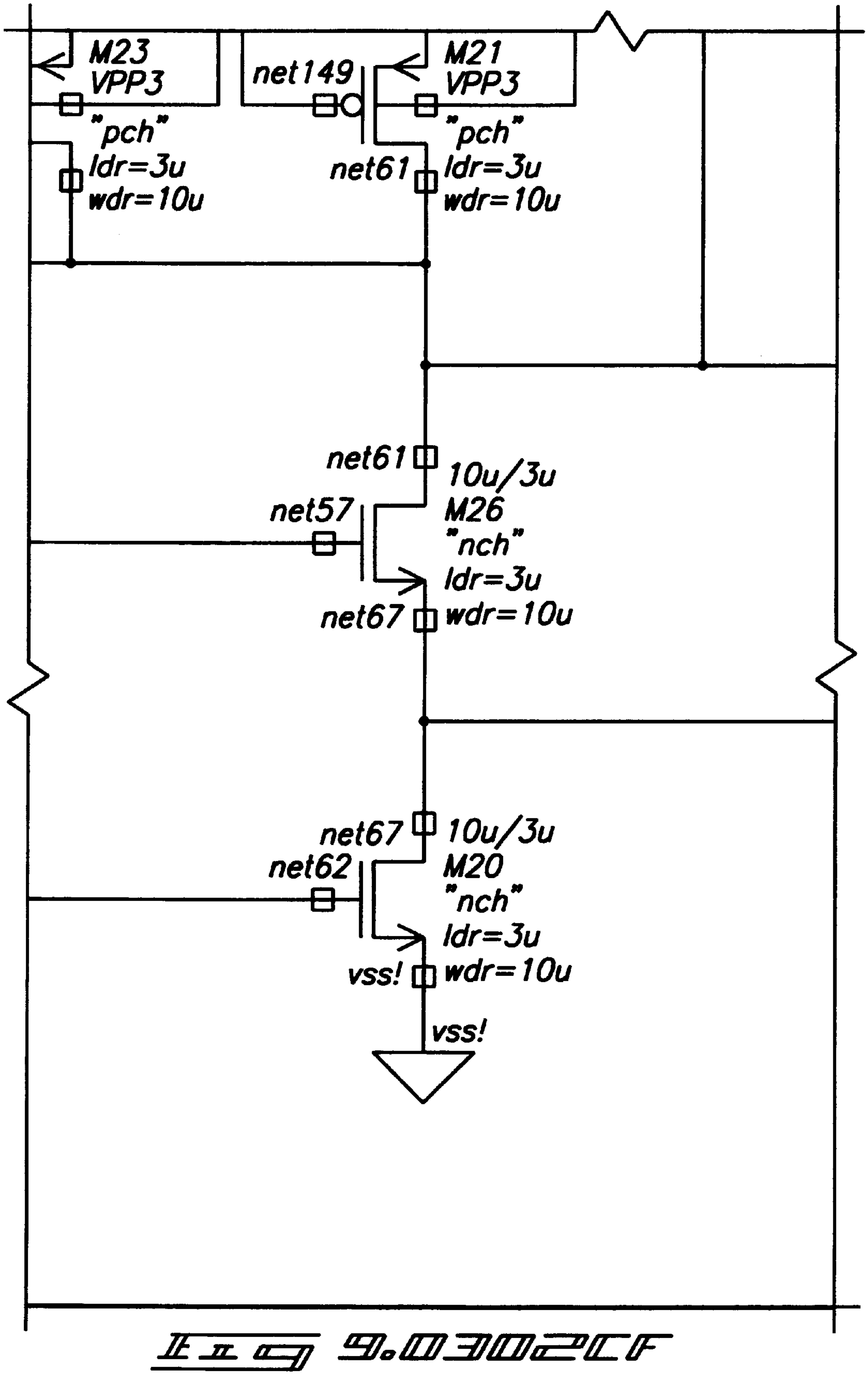
Fig 9.0302CF

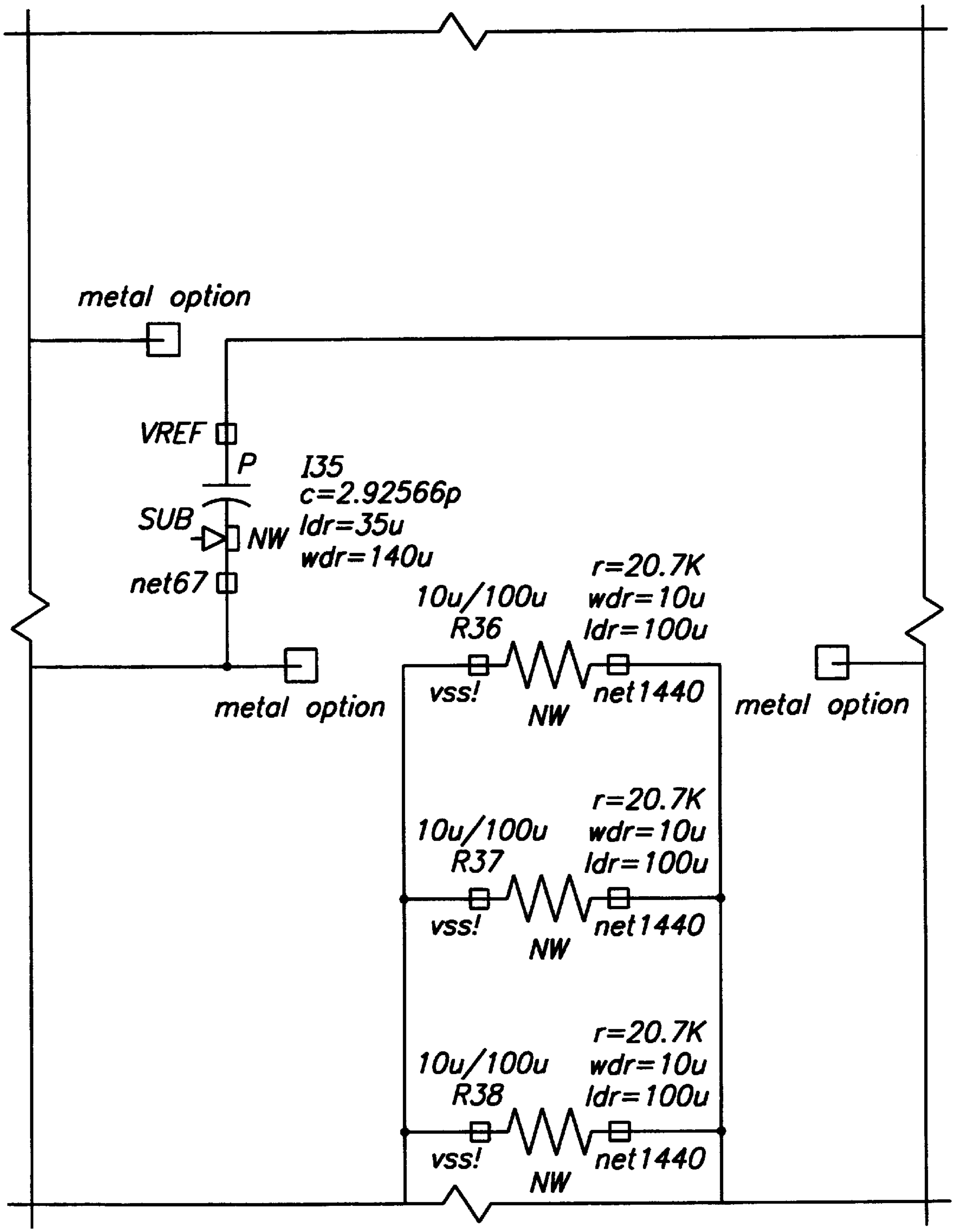
Fig 9.0302CG

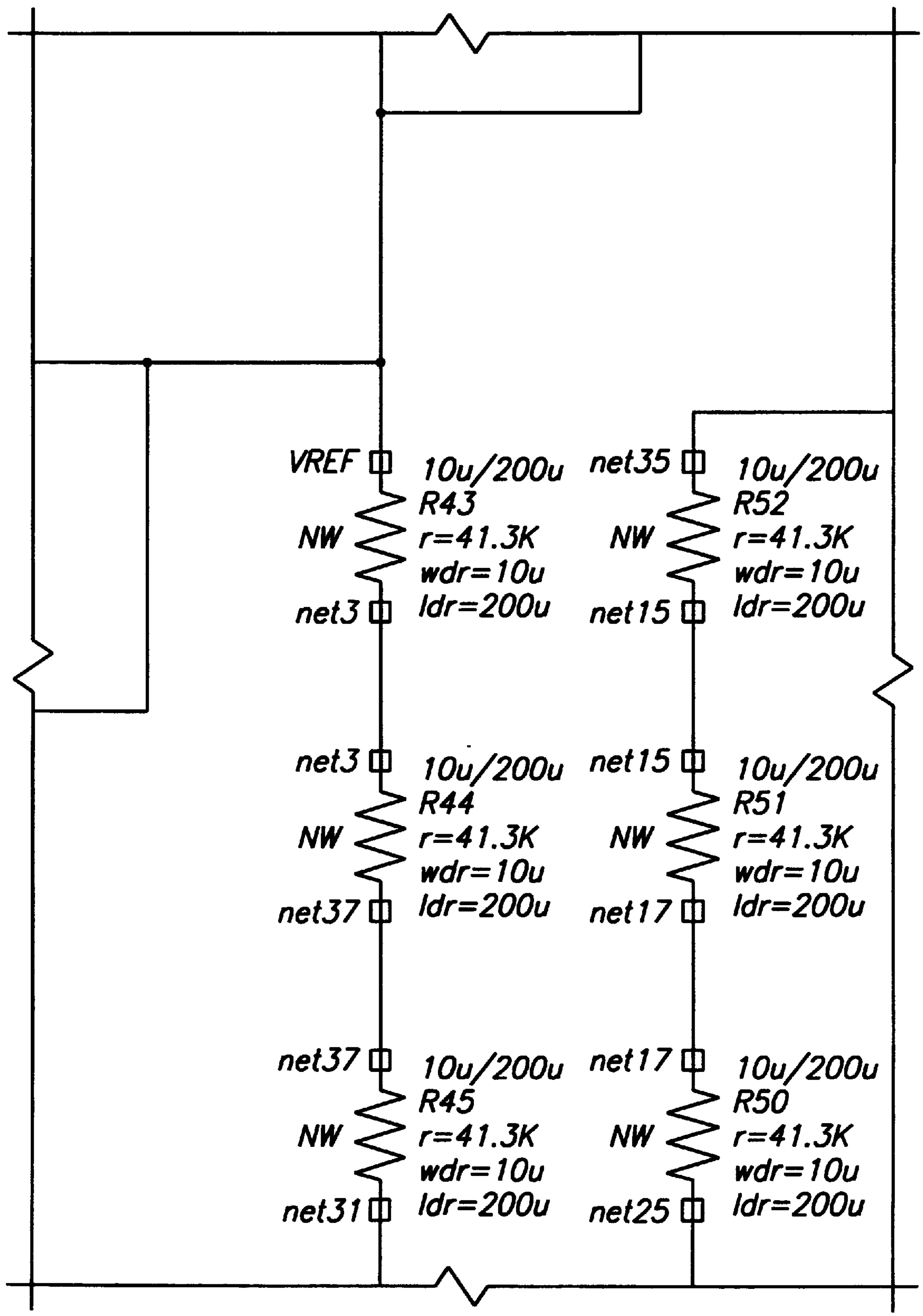
Fig 9.0302CH

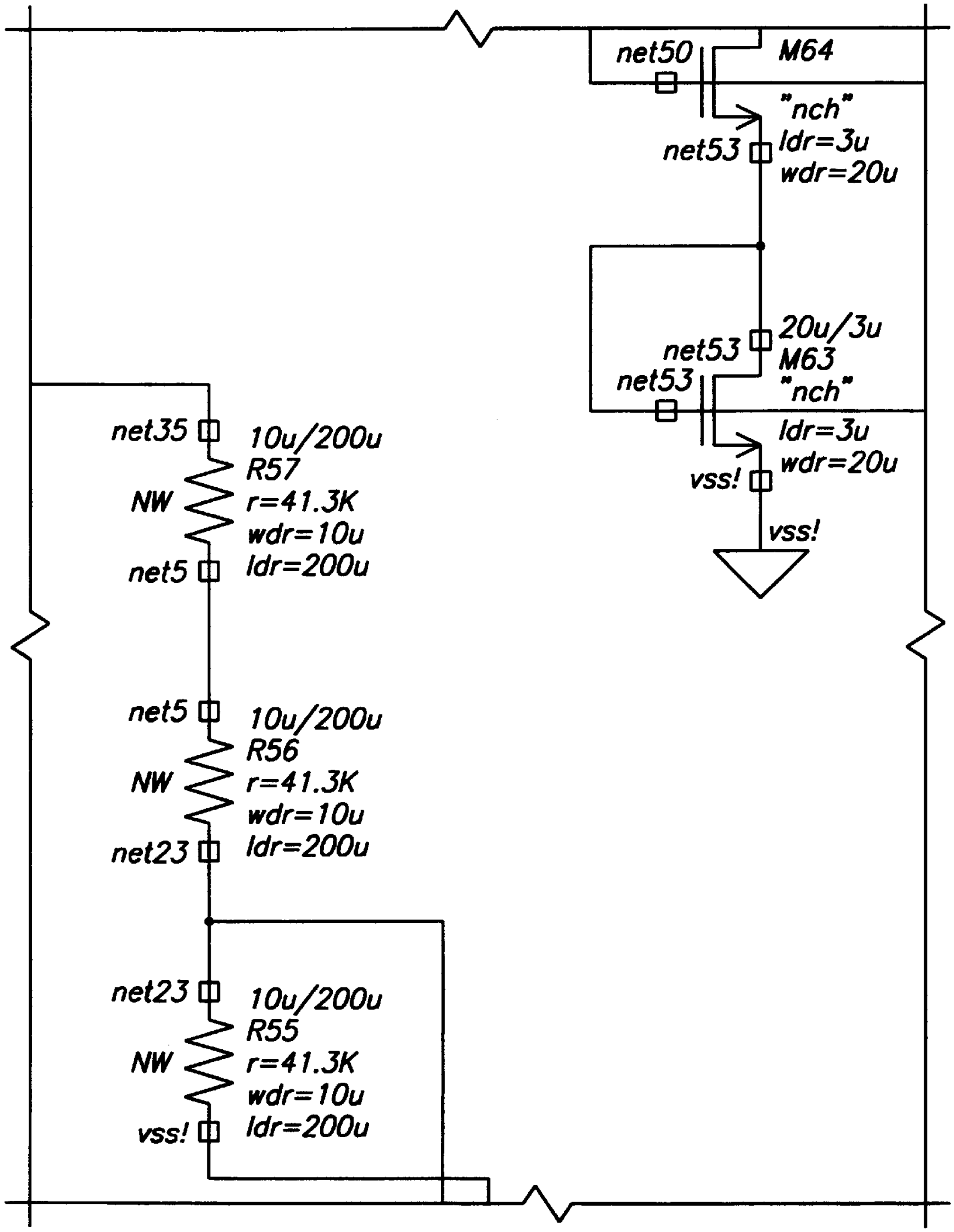
Fig 9.0302CI

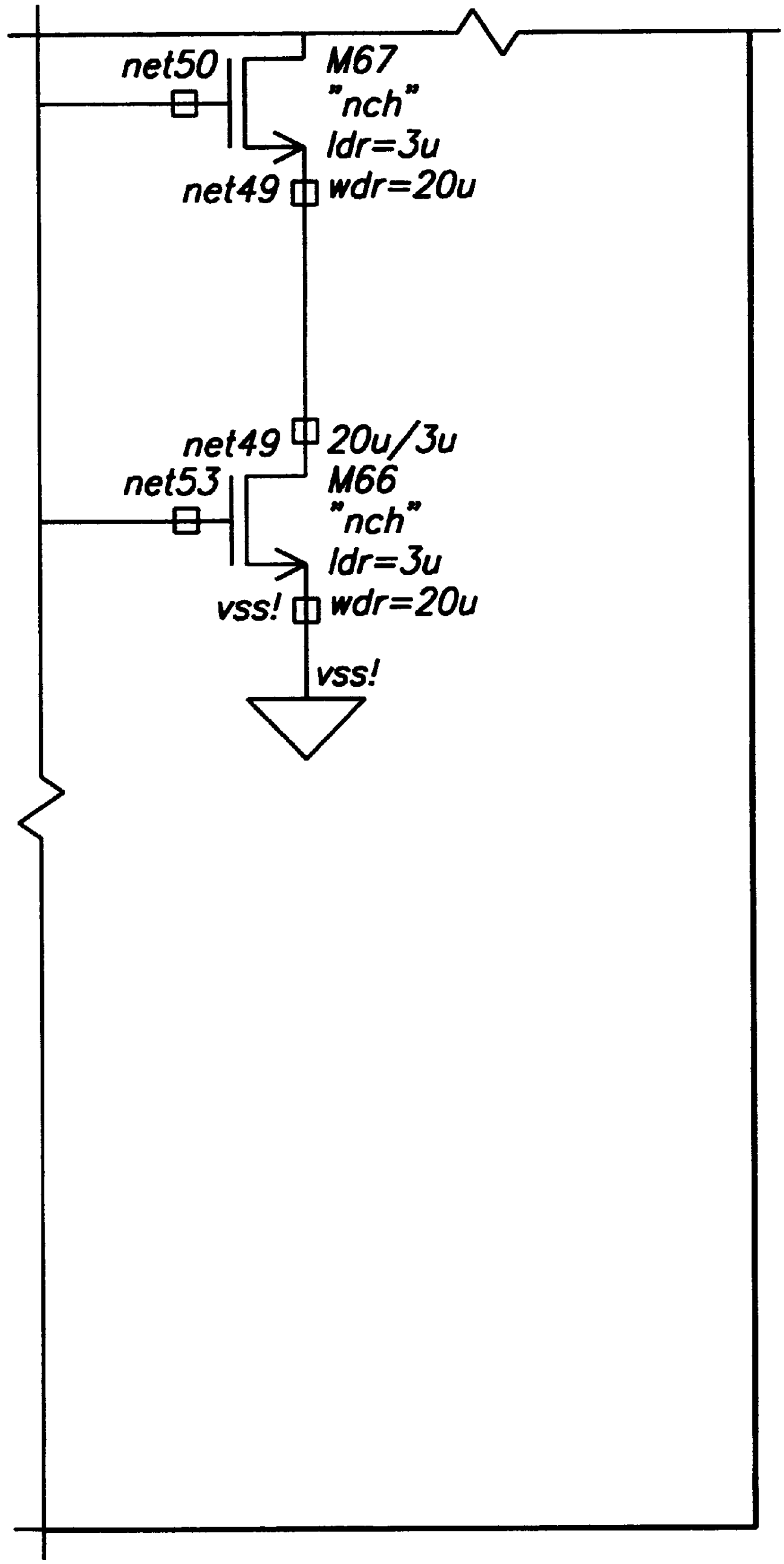
Fig 9.0302Cal

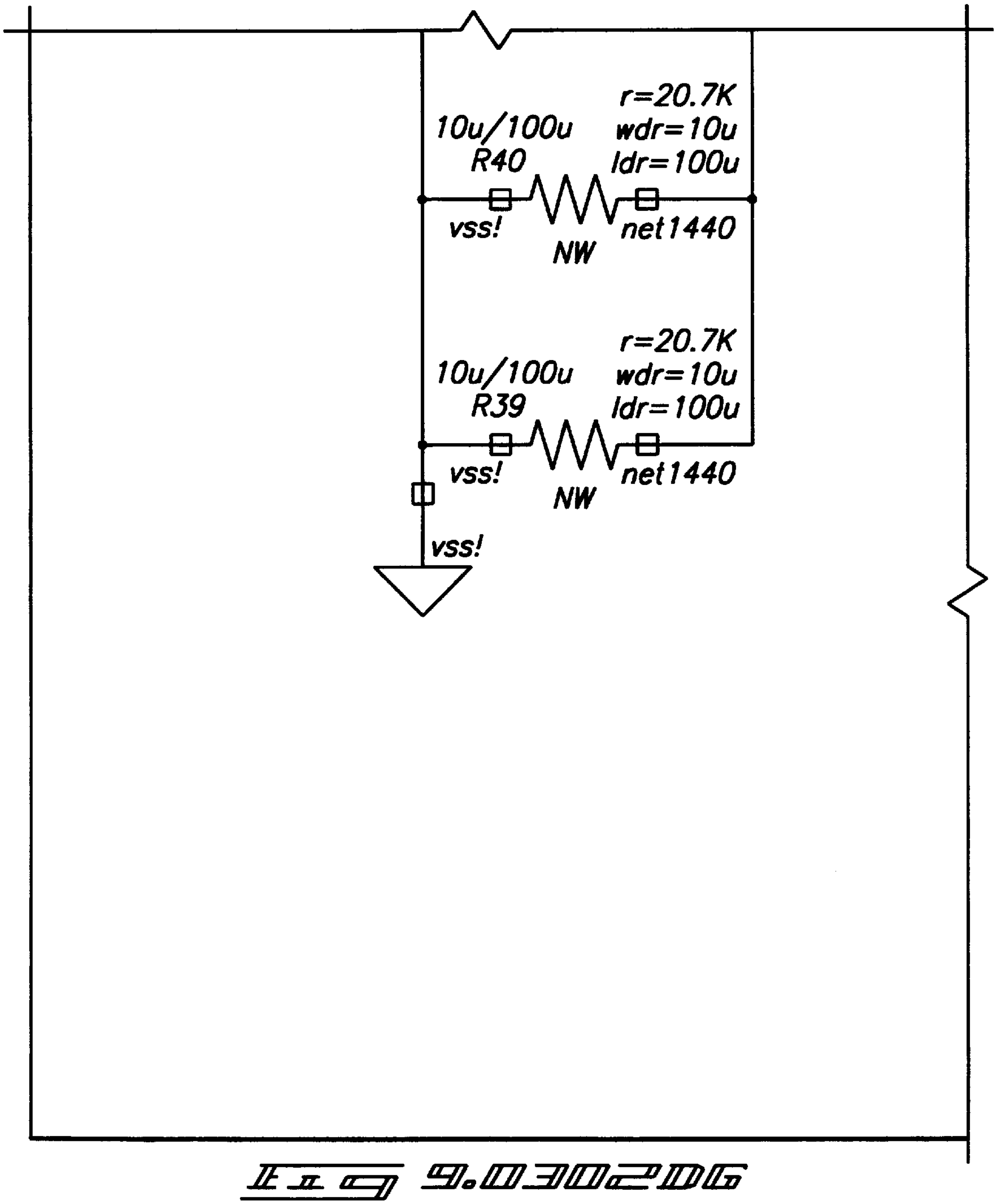
FIG. 9.0302DG

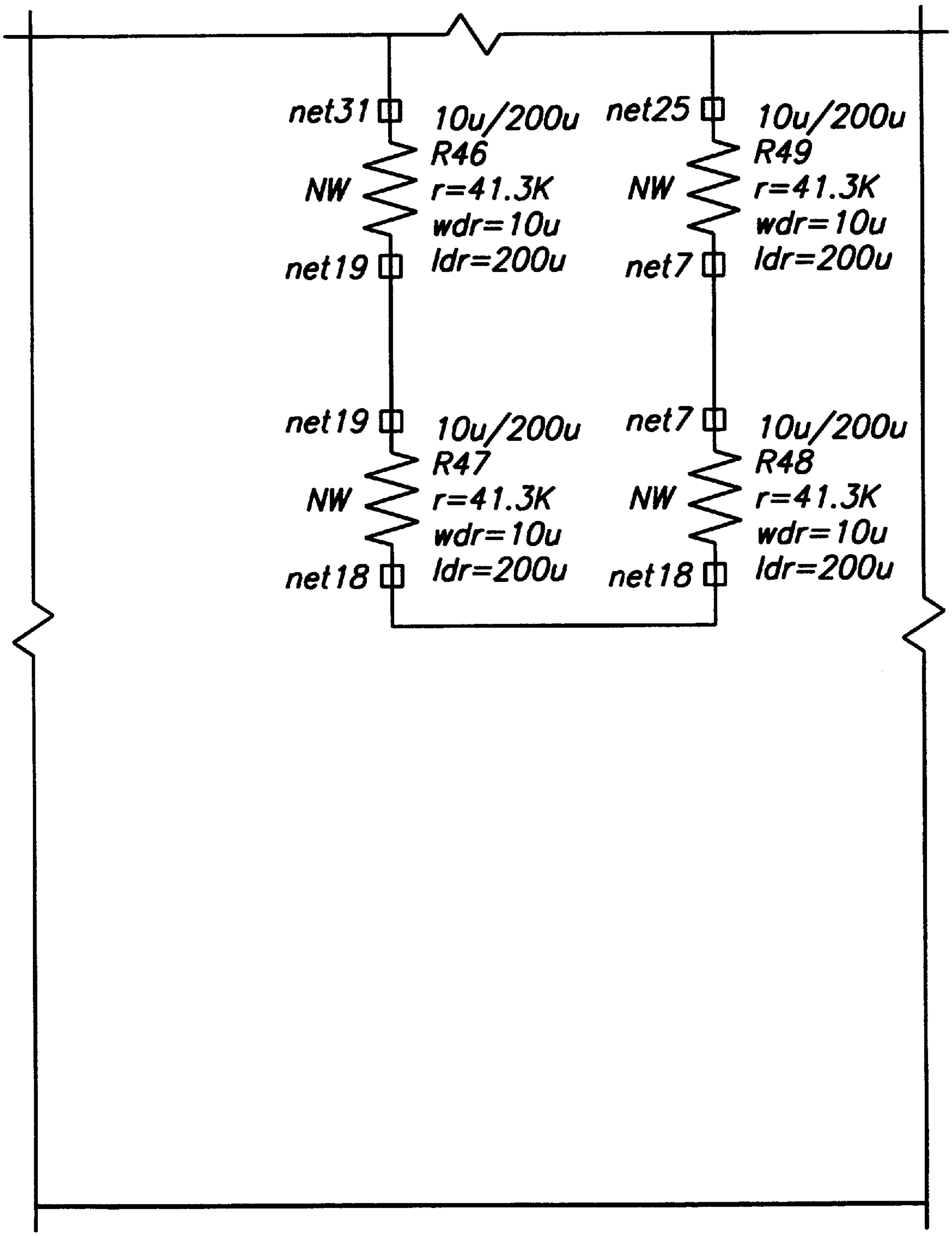
Fig 9.0302DH

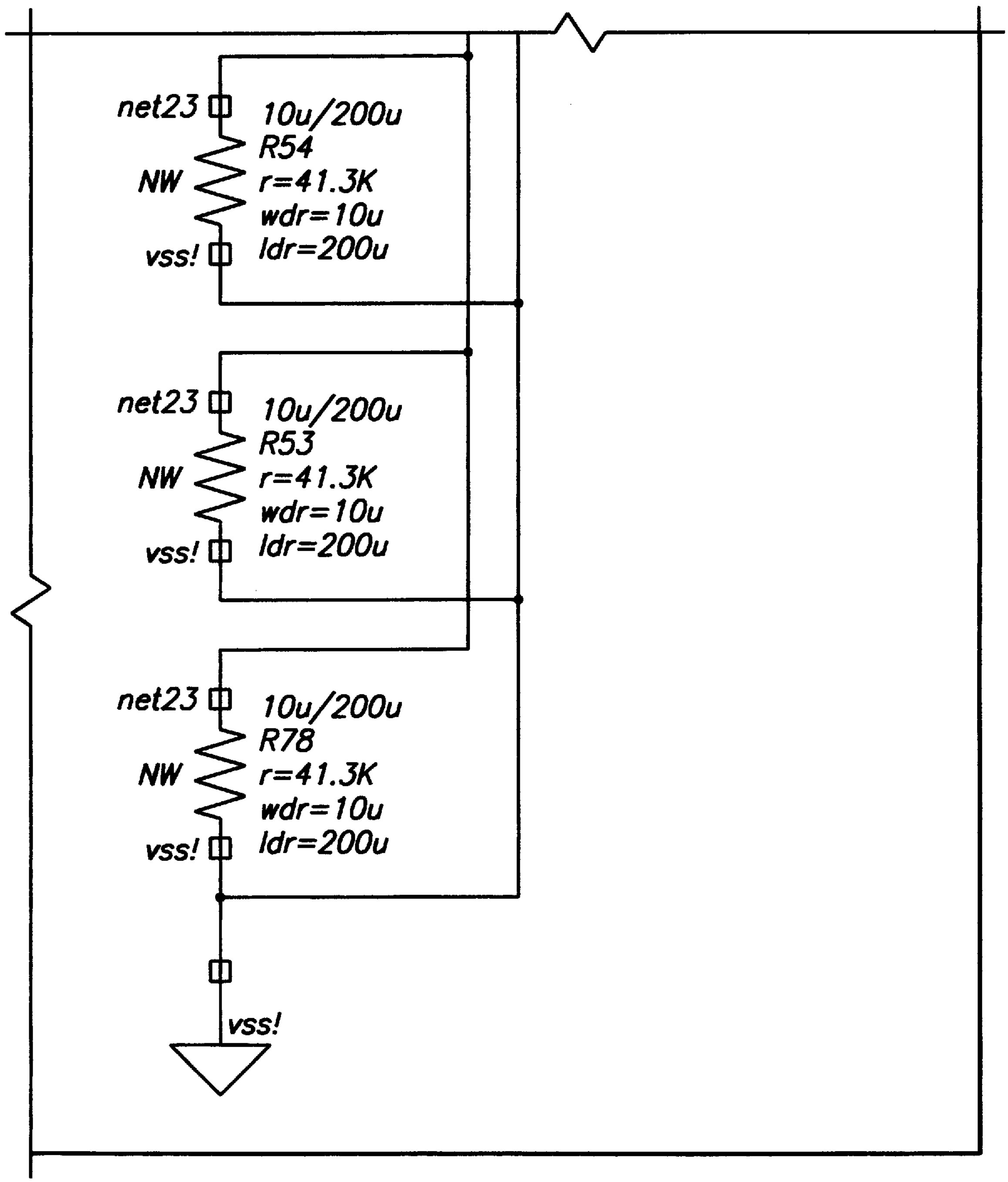
Fig 9.0302DI

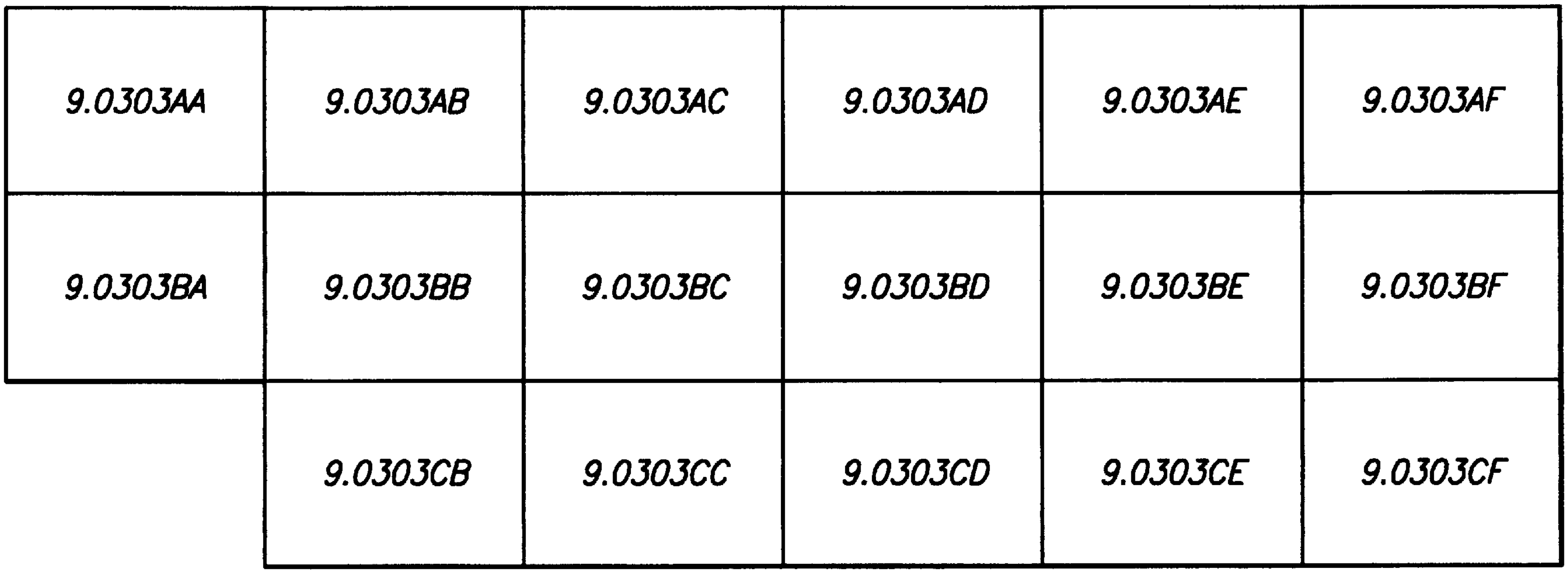
FIG. 9.0303

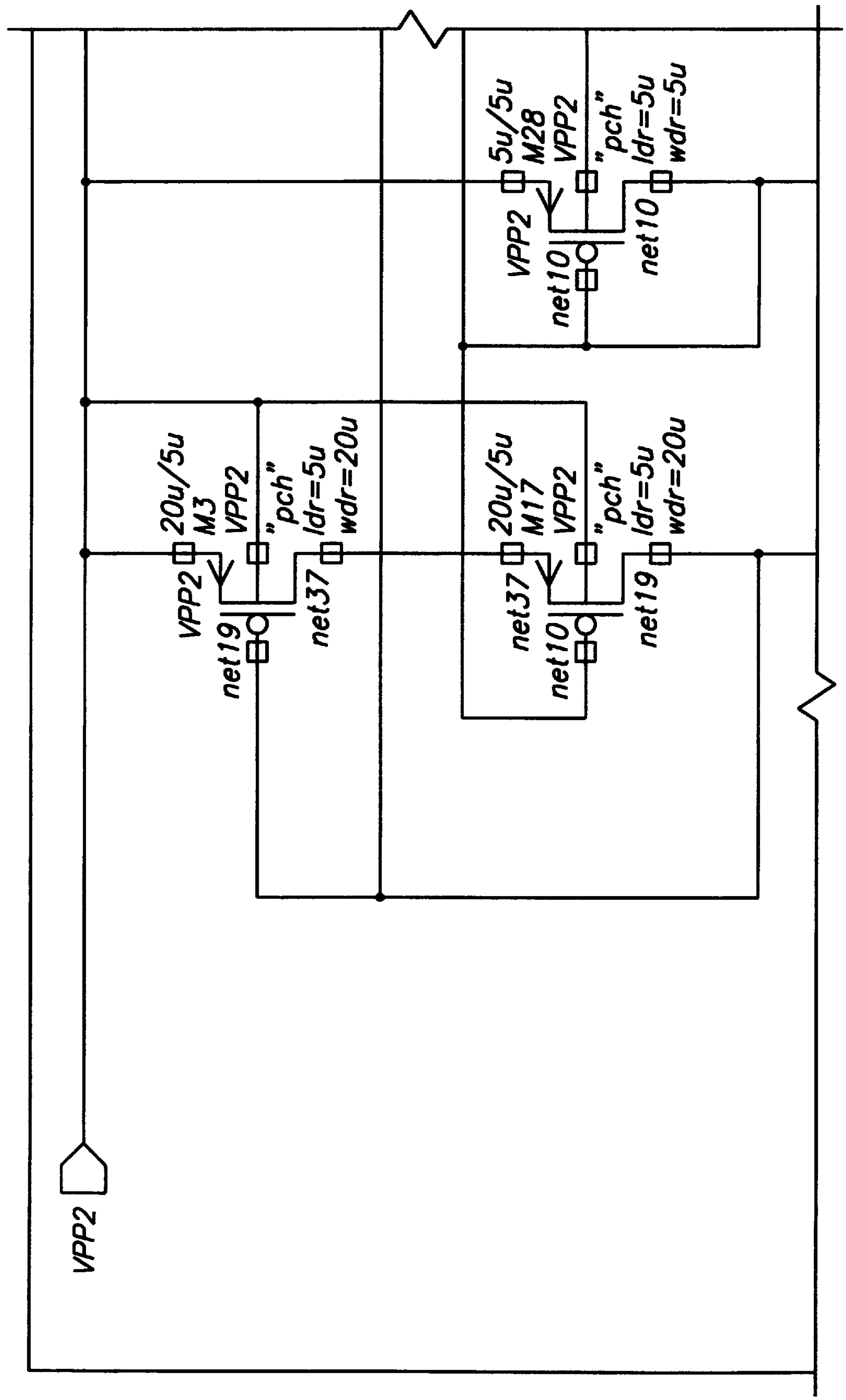
FIG. 9.0E0EAAA

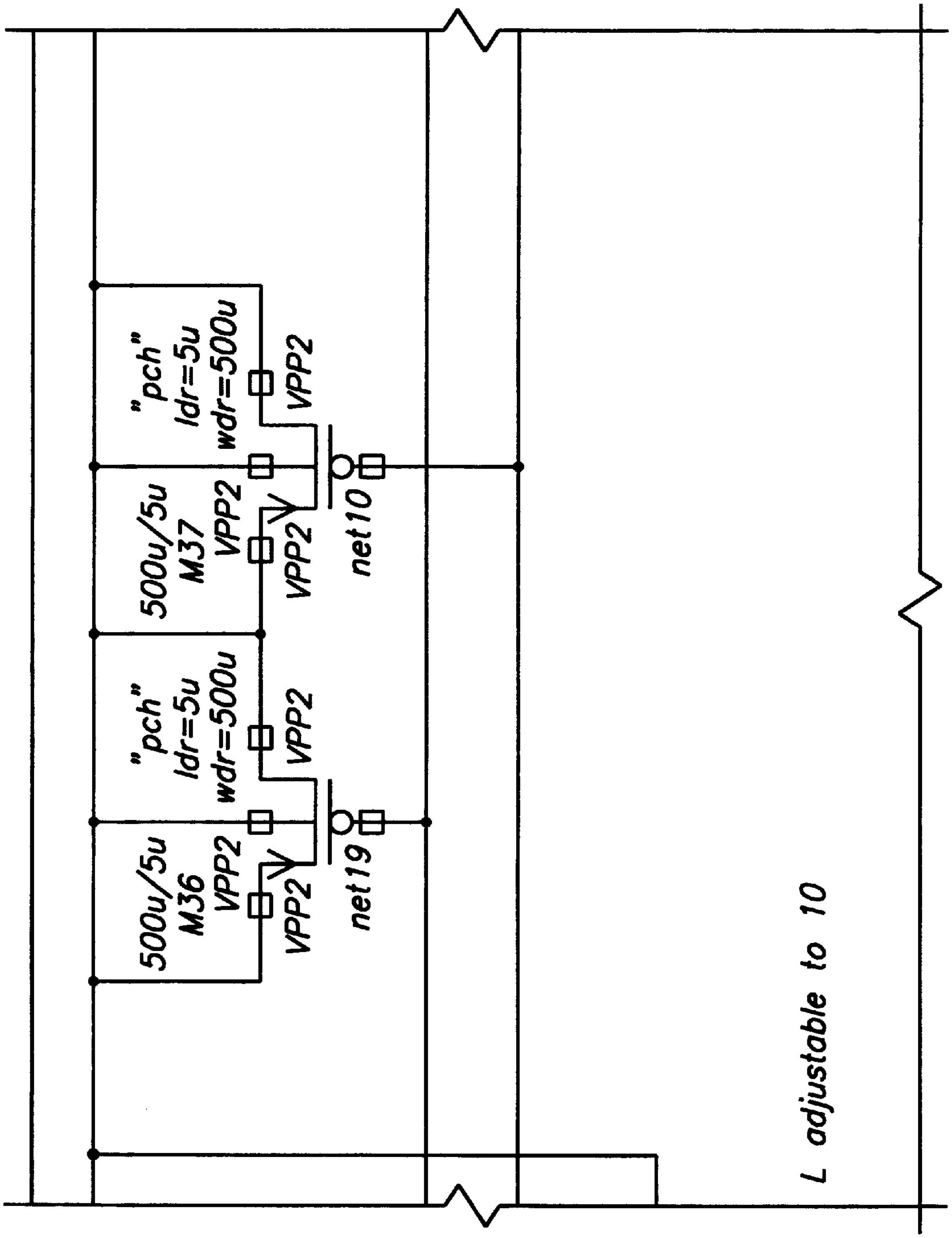
FIG. 9.0303AB

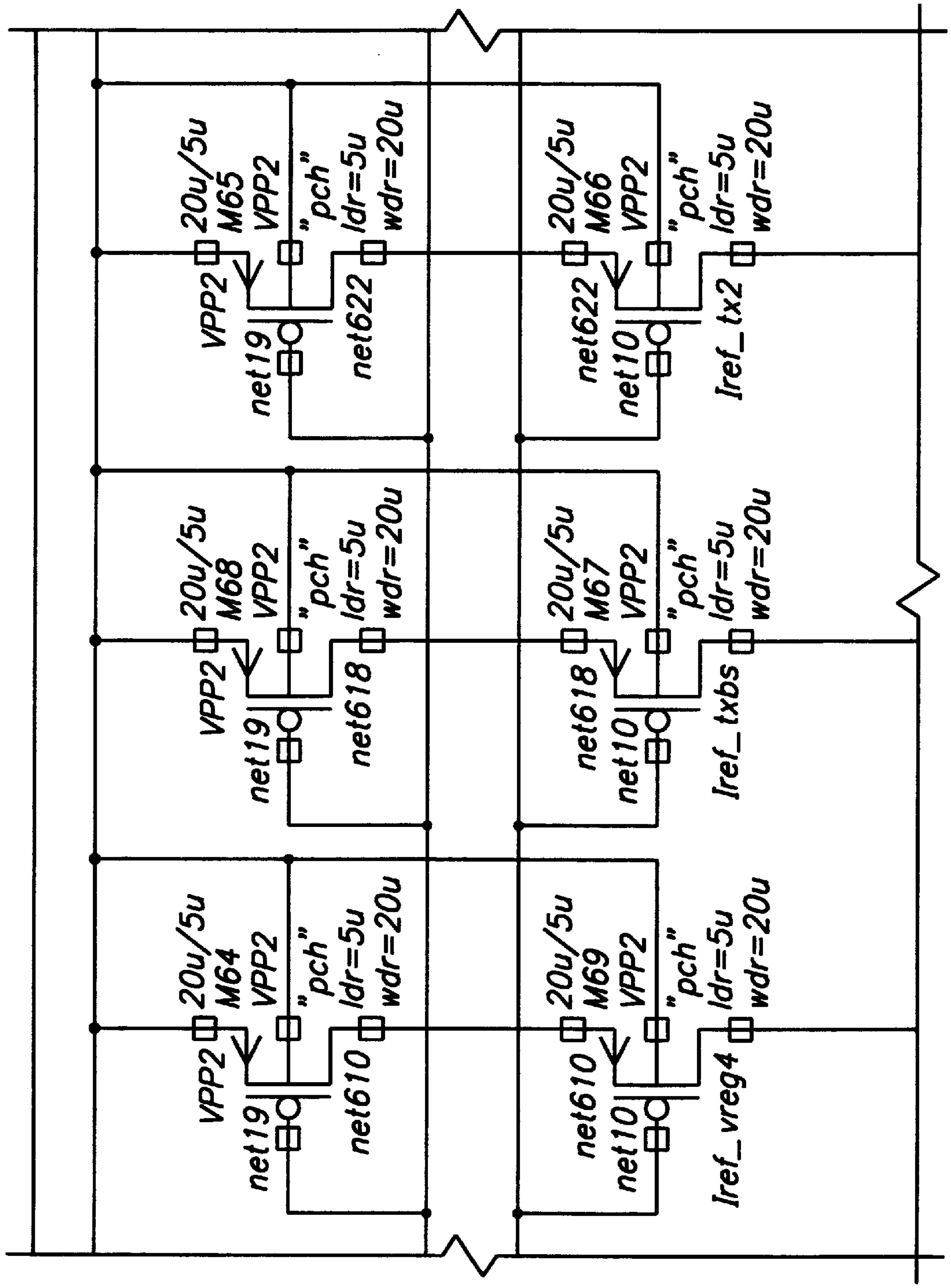
FIG. 9.0303AC

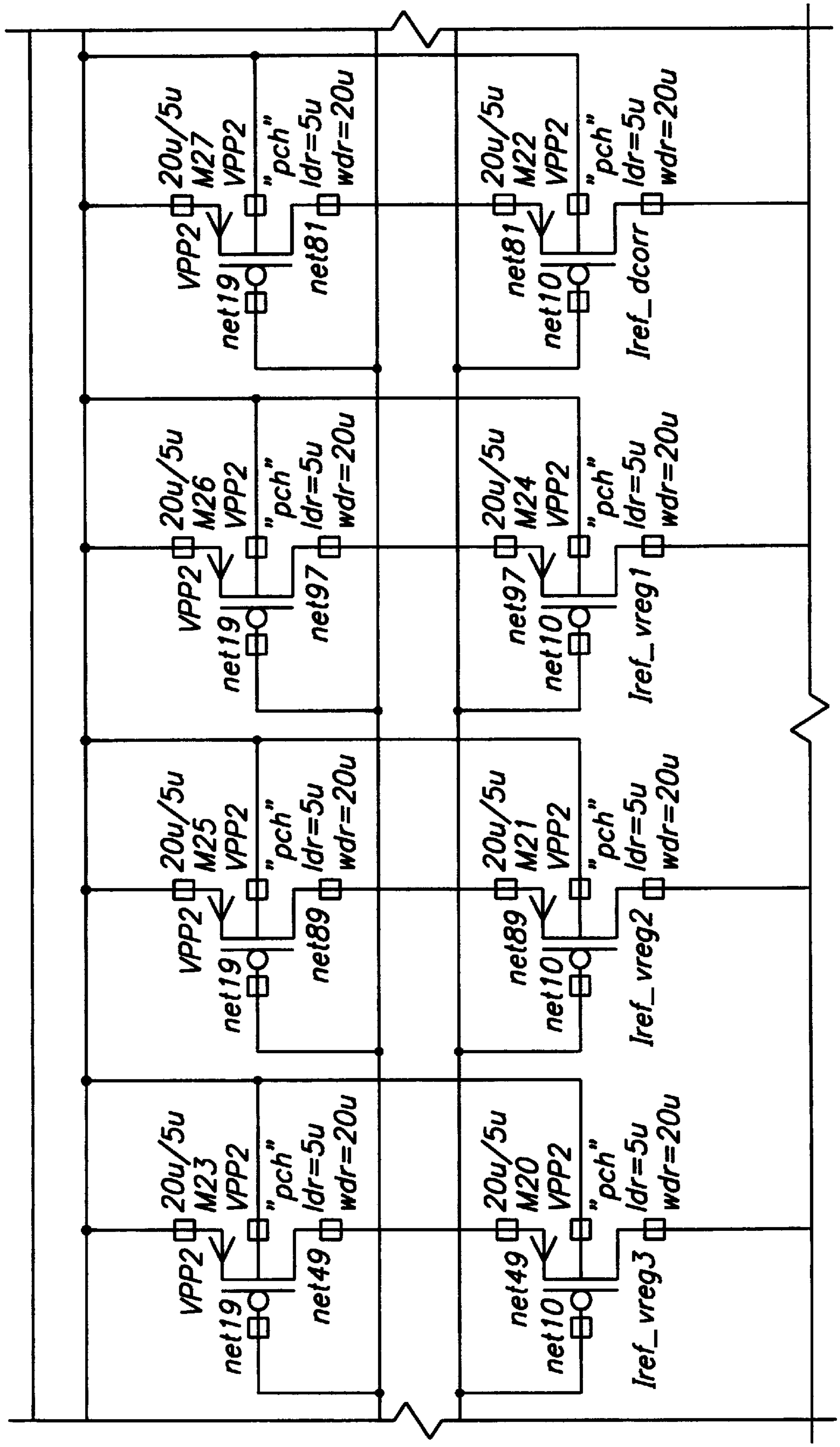
Fig. 9.0303AD

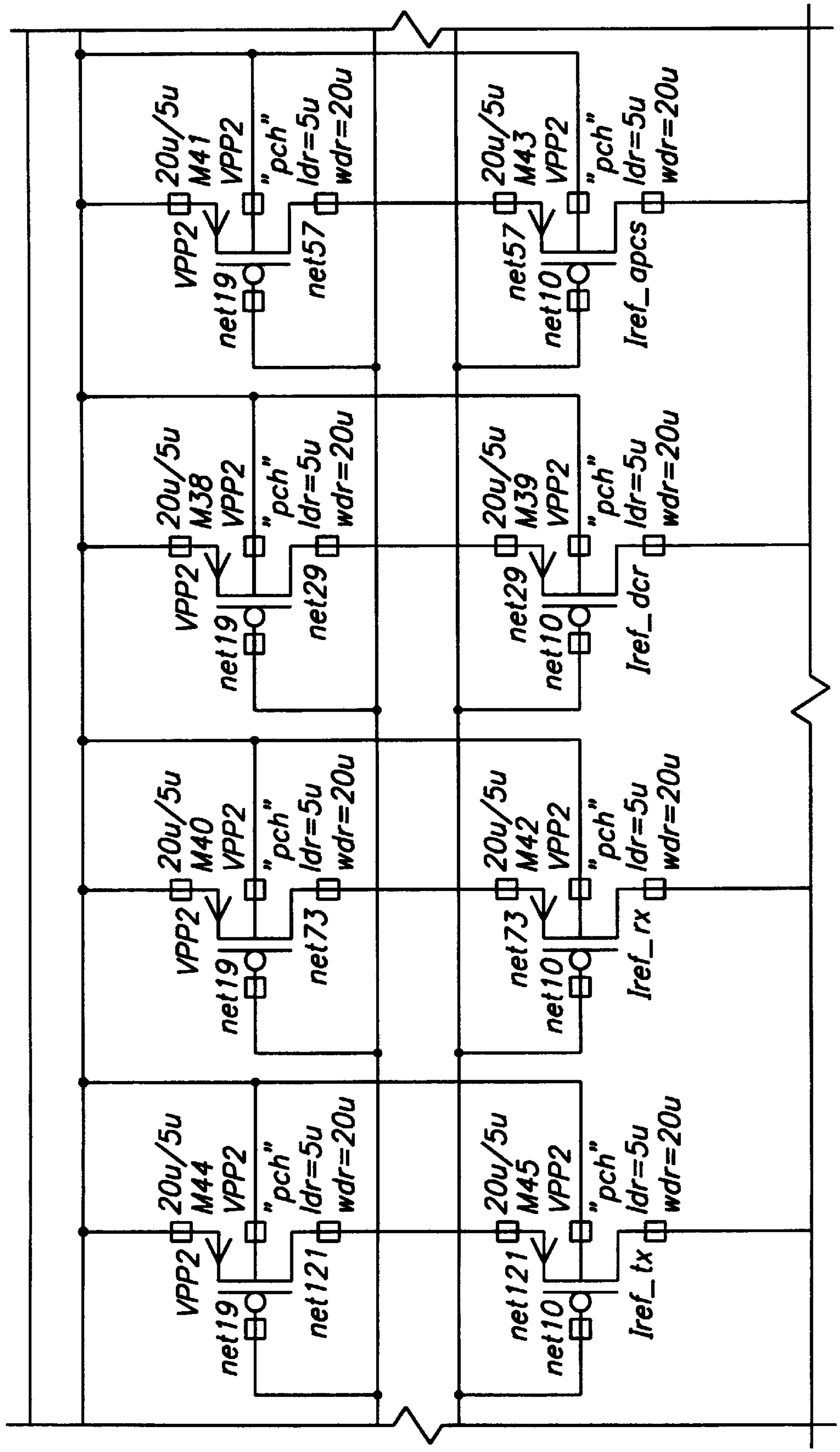
FIG. 9.DEDE3AE

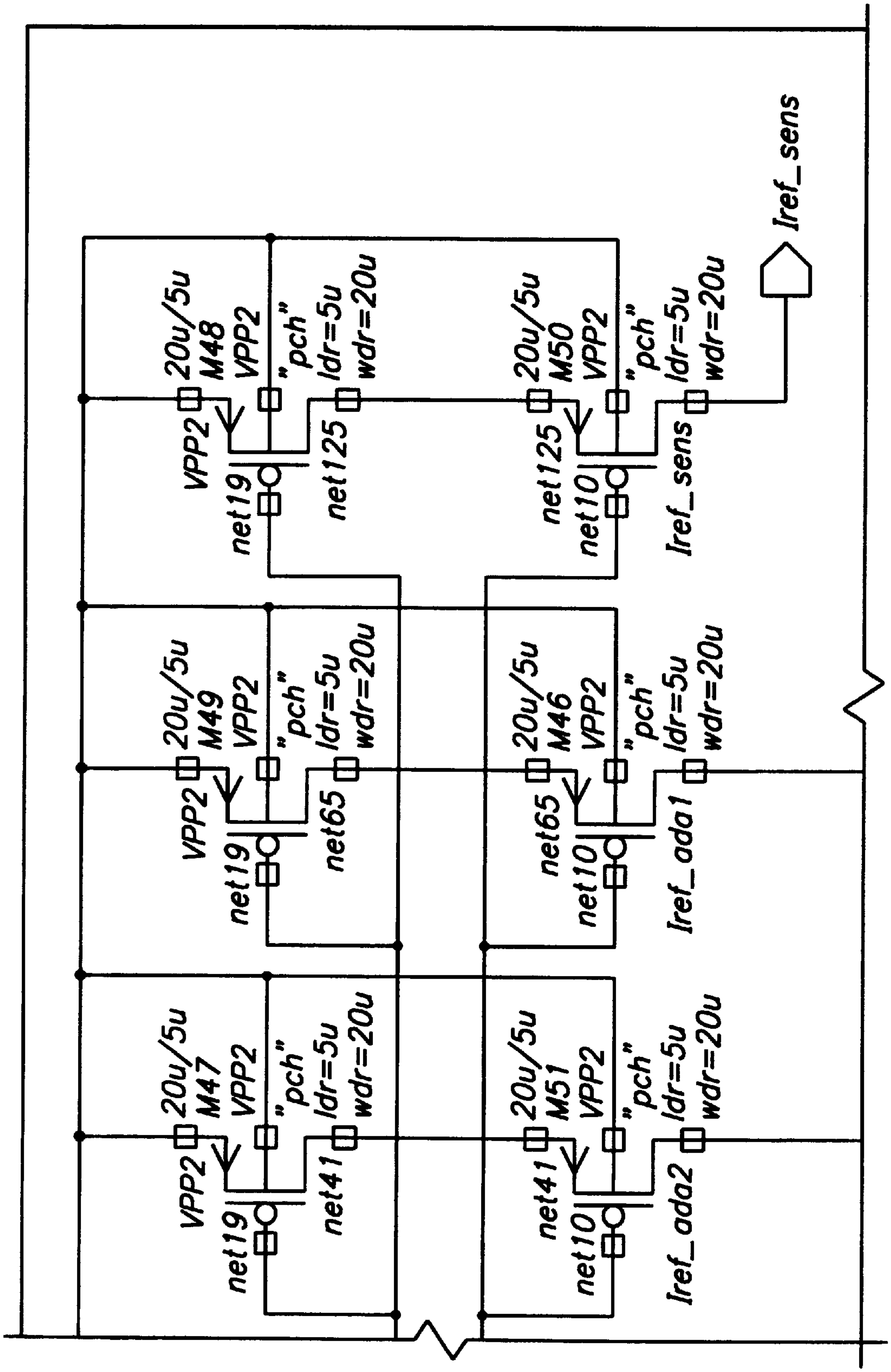
Iref_sens
20u/5u
M48
VPP2
"pch"
ldr=5u
wdr=20u
VPP2
net19
net125
M50
net10
Iref_sens
M49
net65
M46
Iref_ada1
M47
net41
M51
Iref_ada2

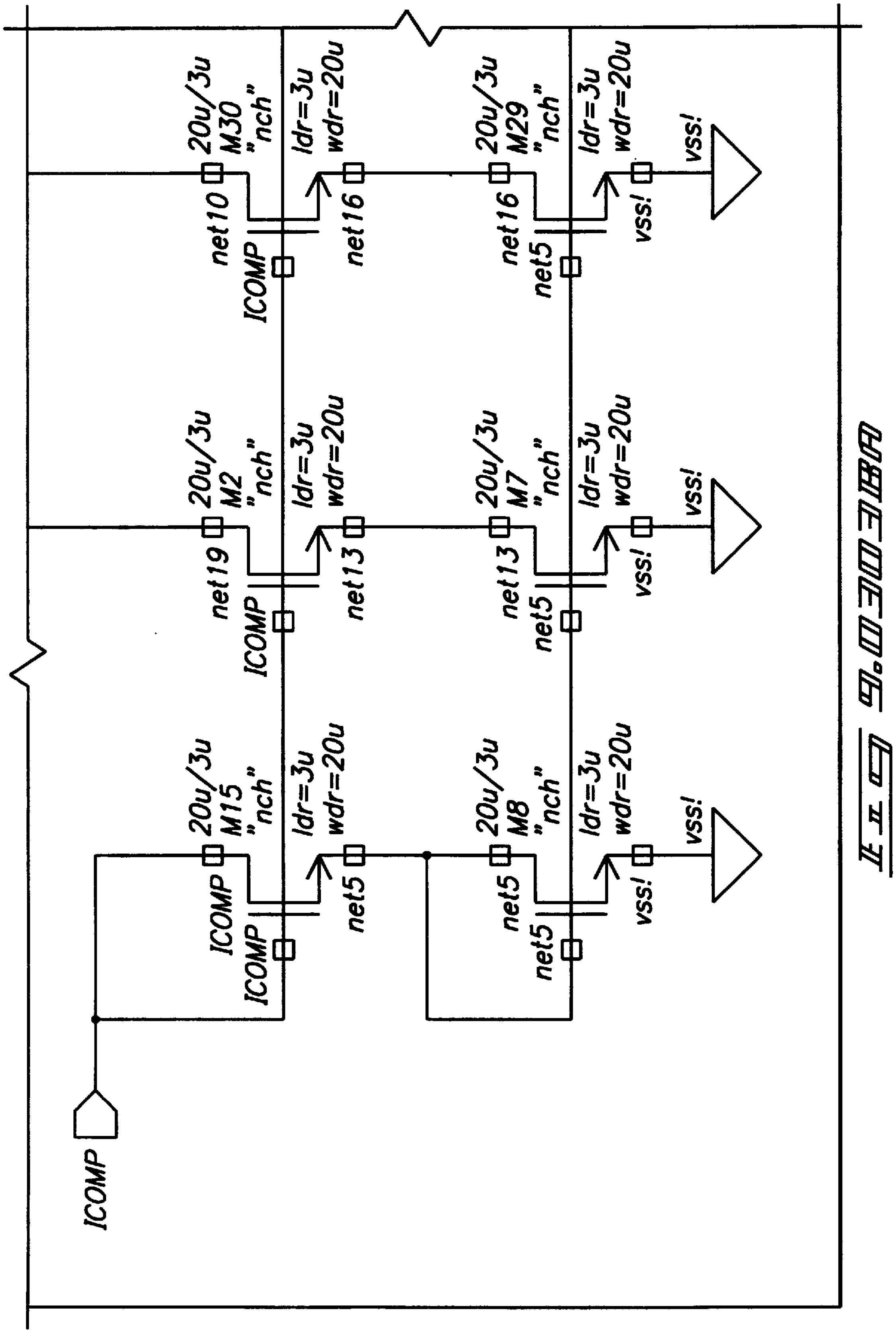
20u/3u
M30
"nch"
ldr=3u
wdr=20u
net10
net16
ICOMP
20u/3u
M29
"nch"
ldr=3u
wdr=20u
net16
net5
vss!
vss!
20u/3u
M2
"nch"
ldr=3u
wdr=20u
net19
net13
ICOMP
20u/3u
M7
"nch"
ldr=3u
wdr=20u
net13
net5
vss!
vss!
20u/3u
M15
"nch"
ldr=3u
wdr=20u
ICOMP
ICOMP
net5
20u/3u
M8
"nch"
ldr=3u
wdr=20u
net5
net5
vss!
vss!
ICOMP

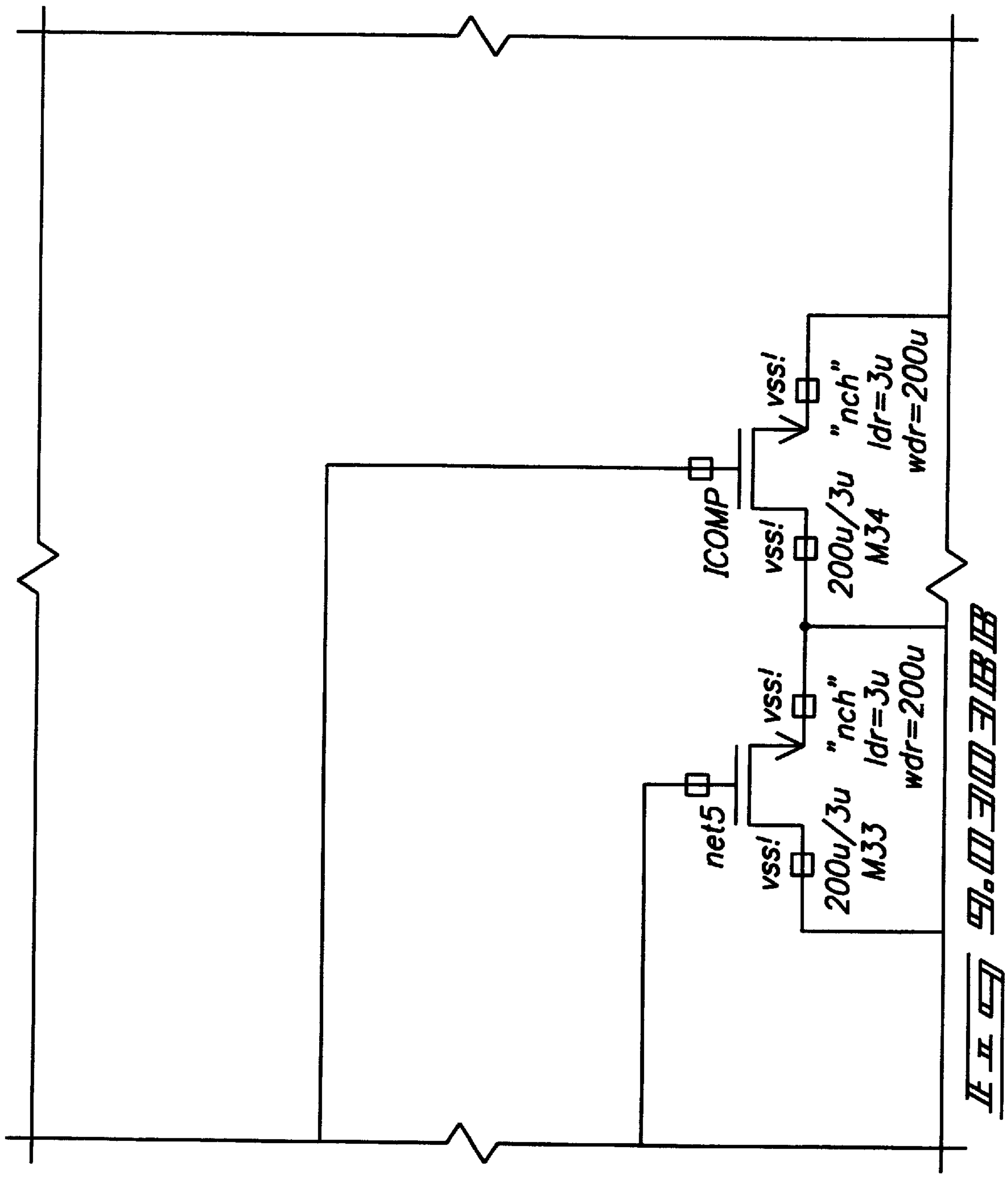
FIG. 9.0303BB

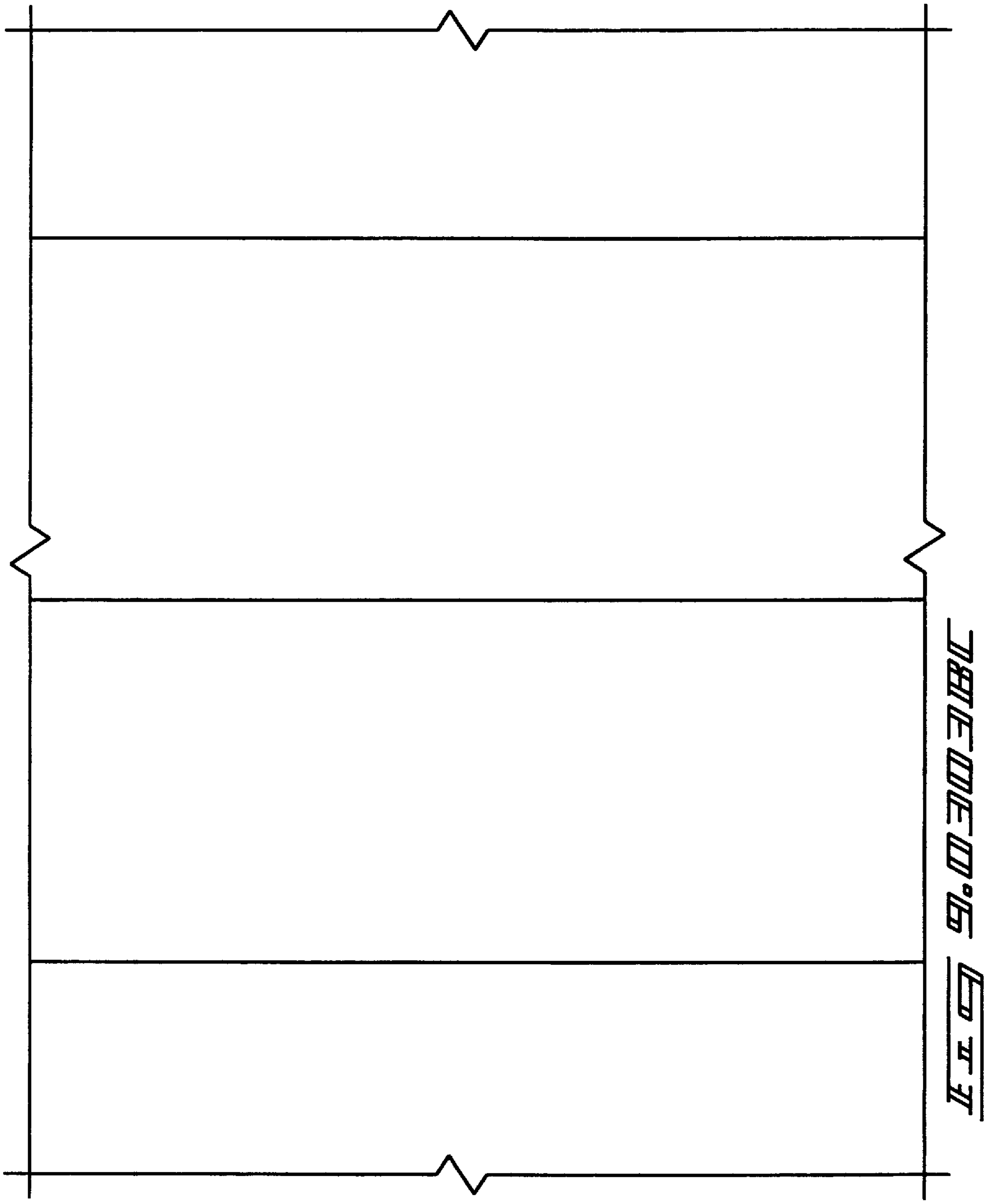
FIG. 9.0303BC

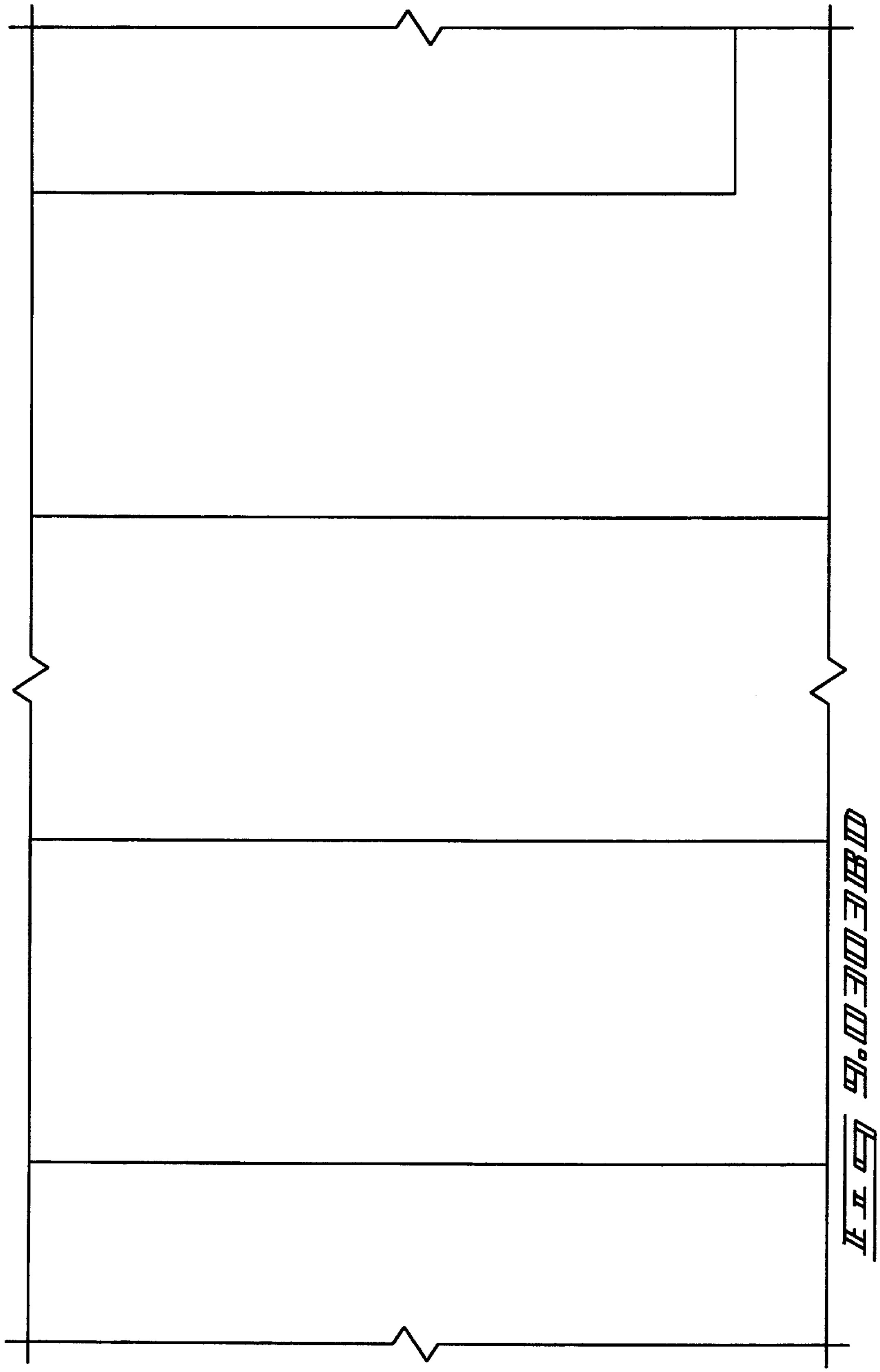
FIG. 9.0303BD

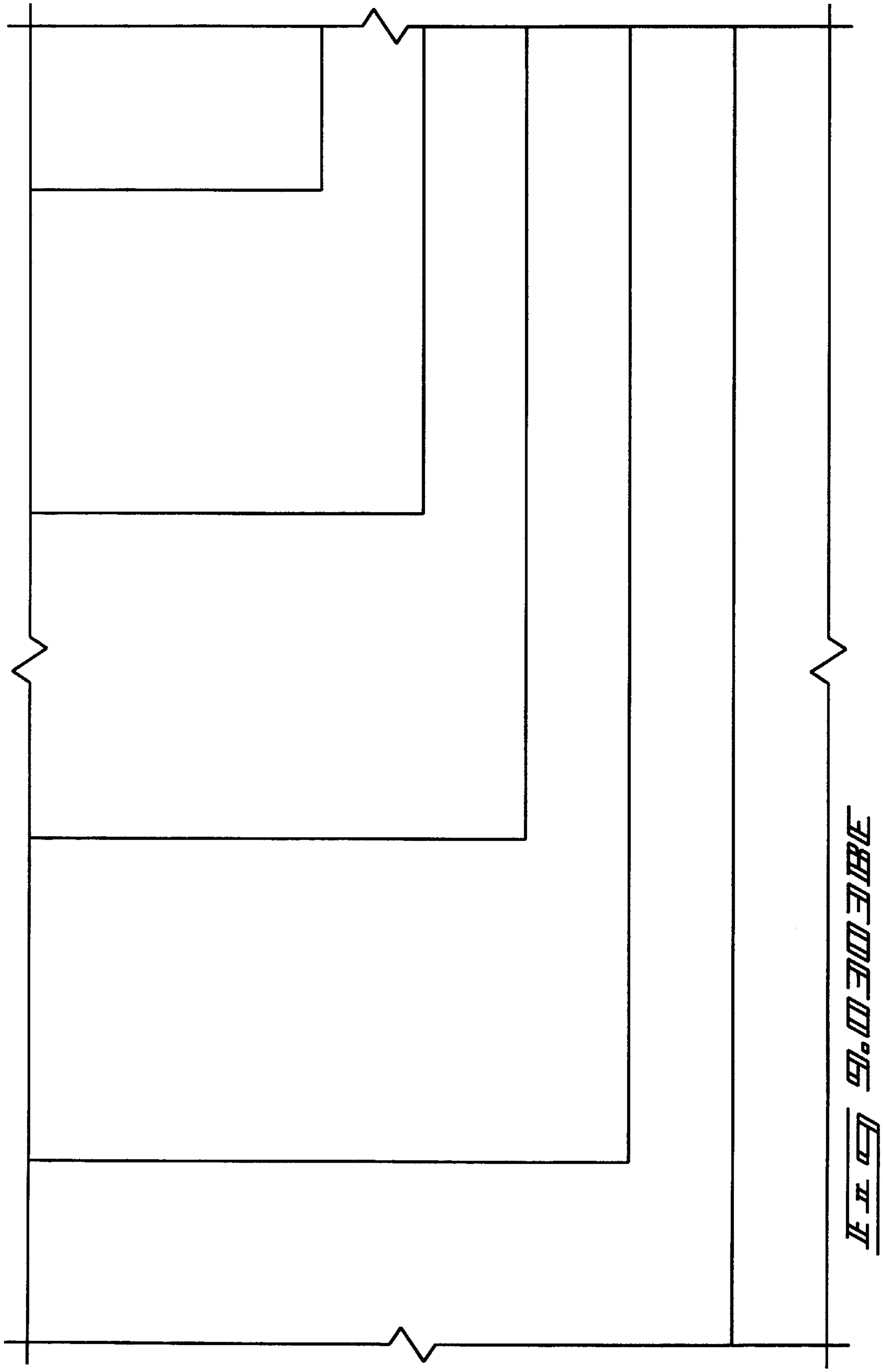
FIG. 9.0303BE

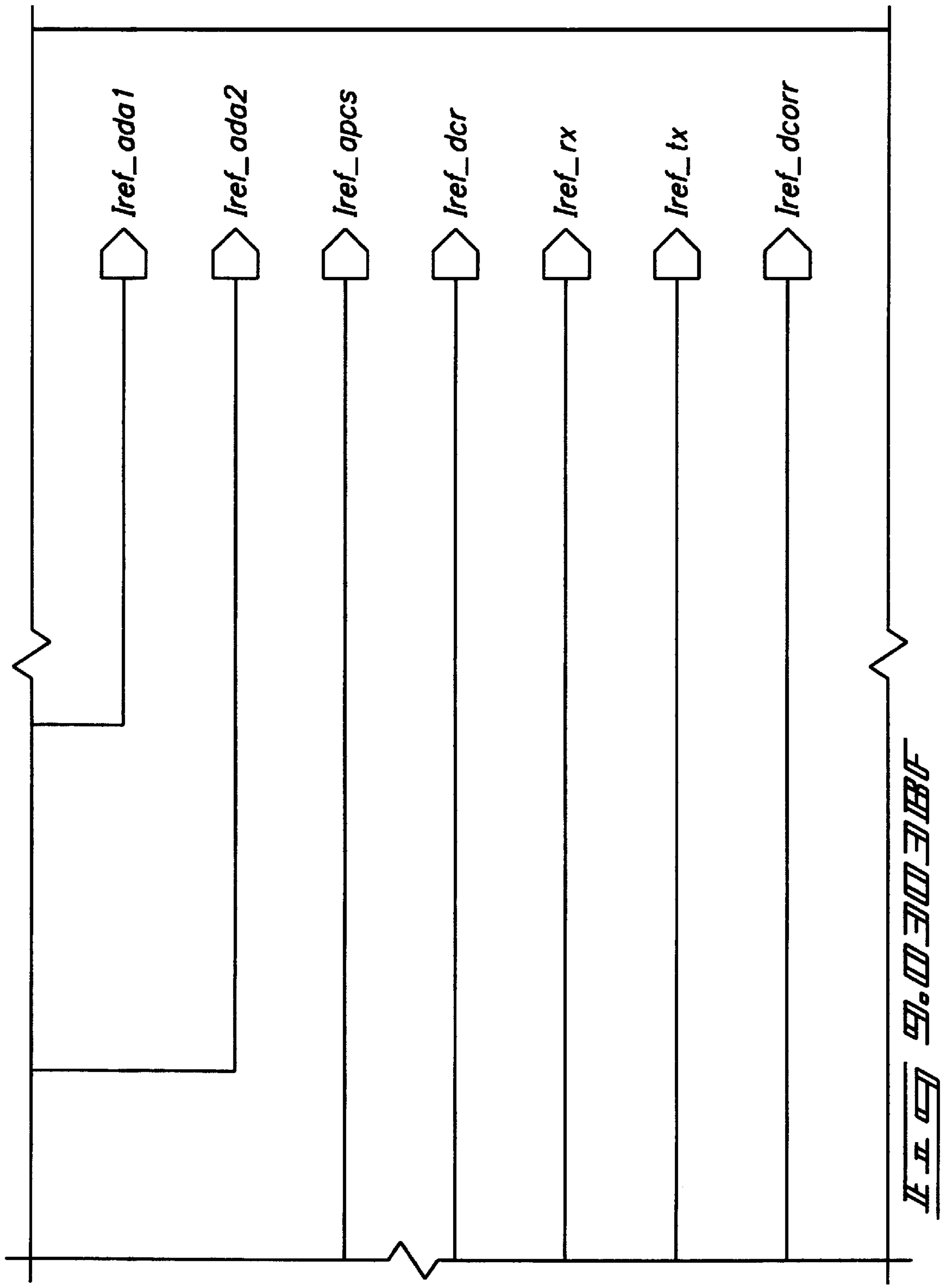
FIG. 9.30.38F

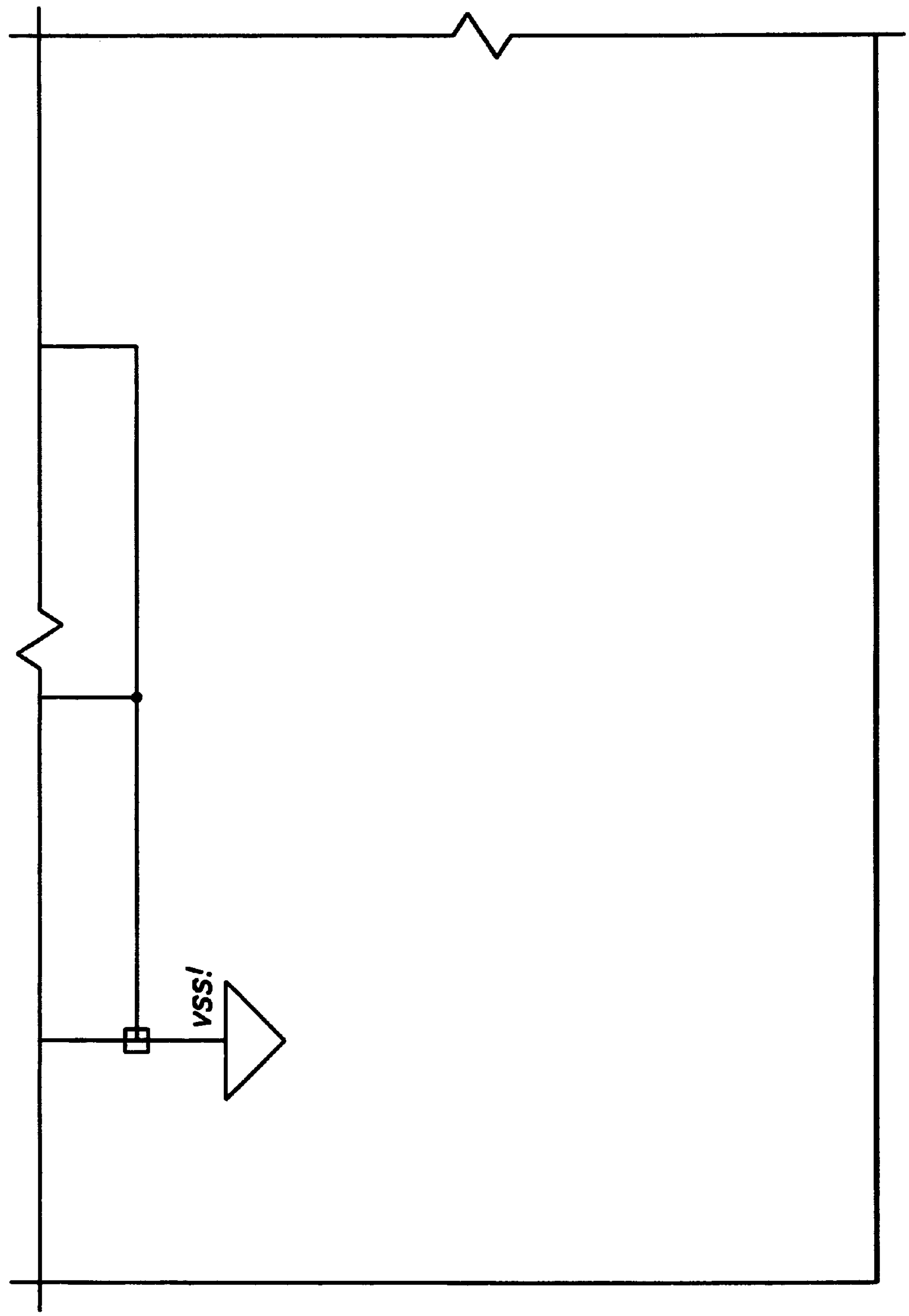
FIG. 9.0303CB

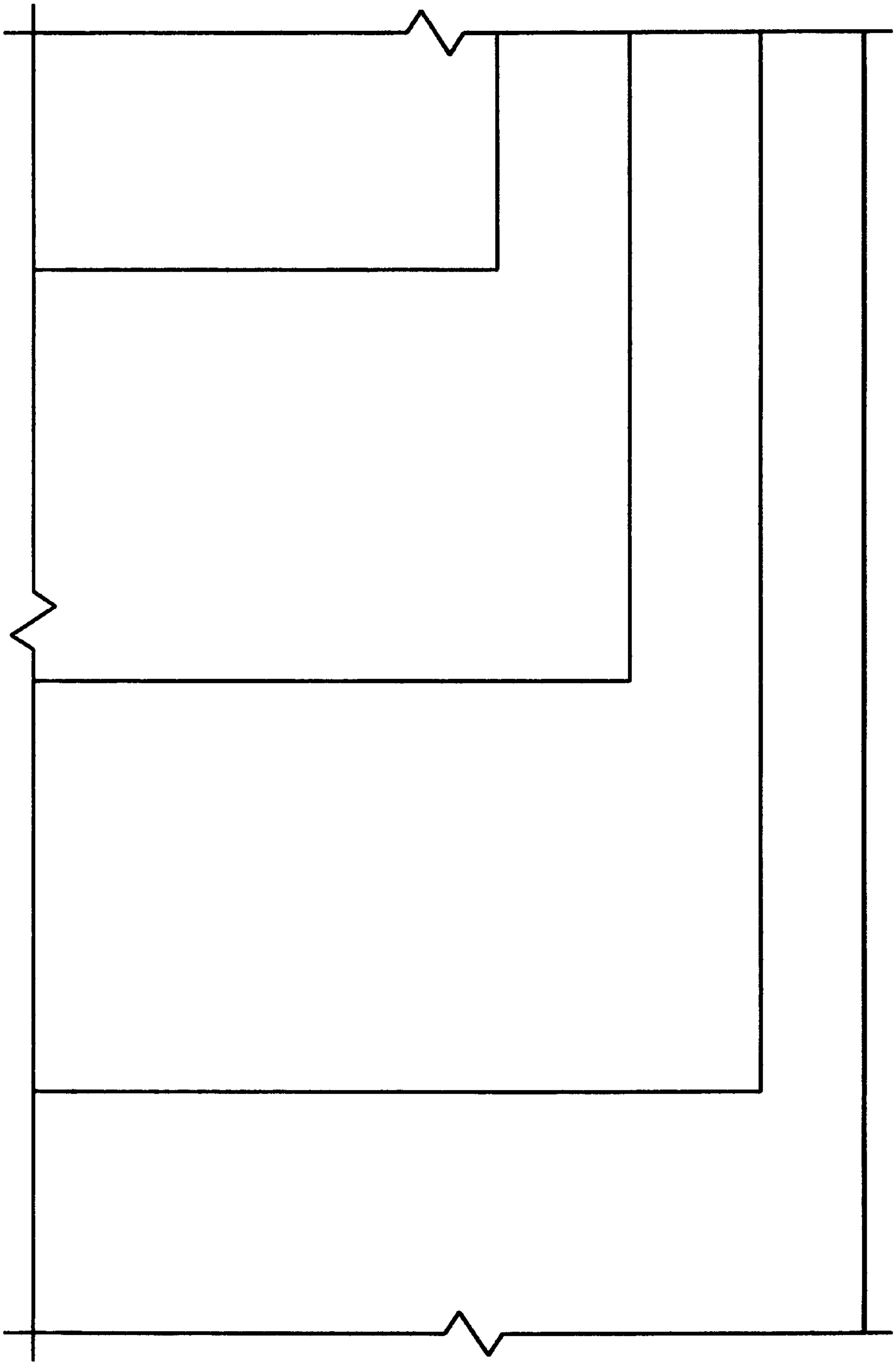
FIG. 9.0303CC

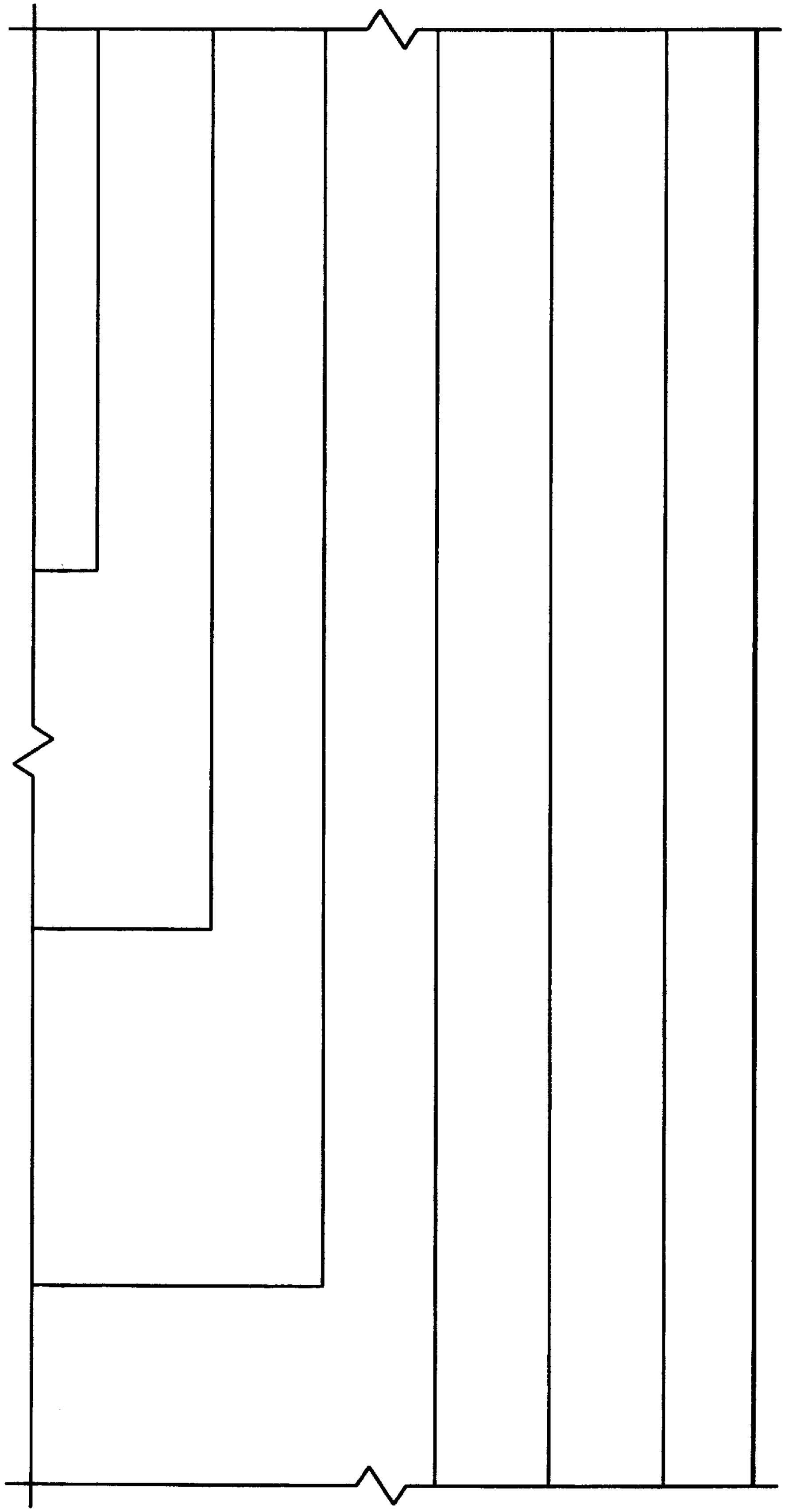
FIG. 9.0303CD

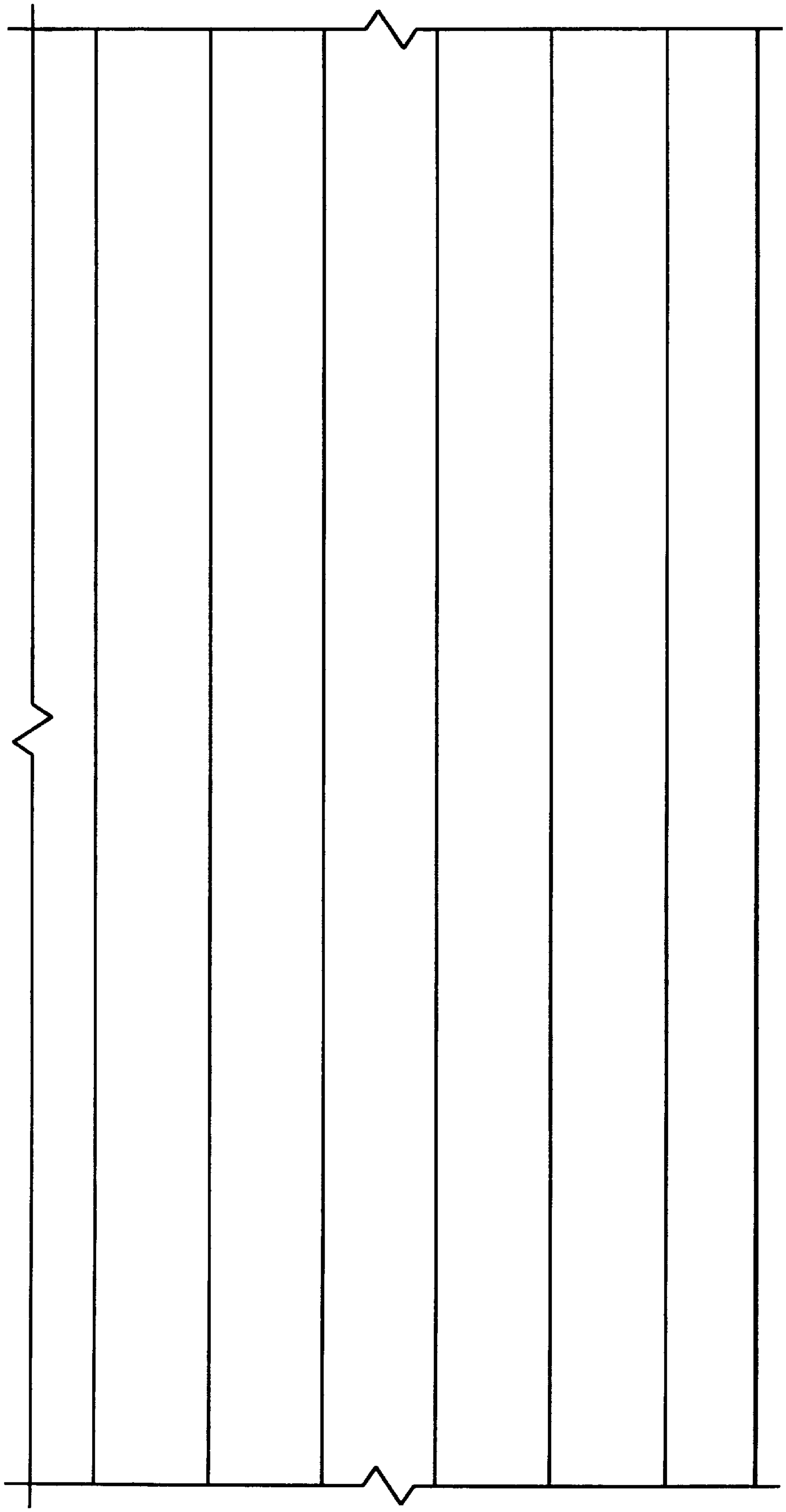
FIG. 9.0303CE

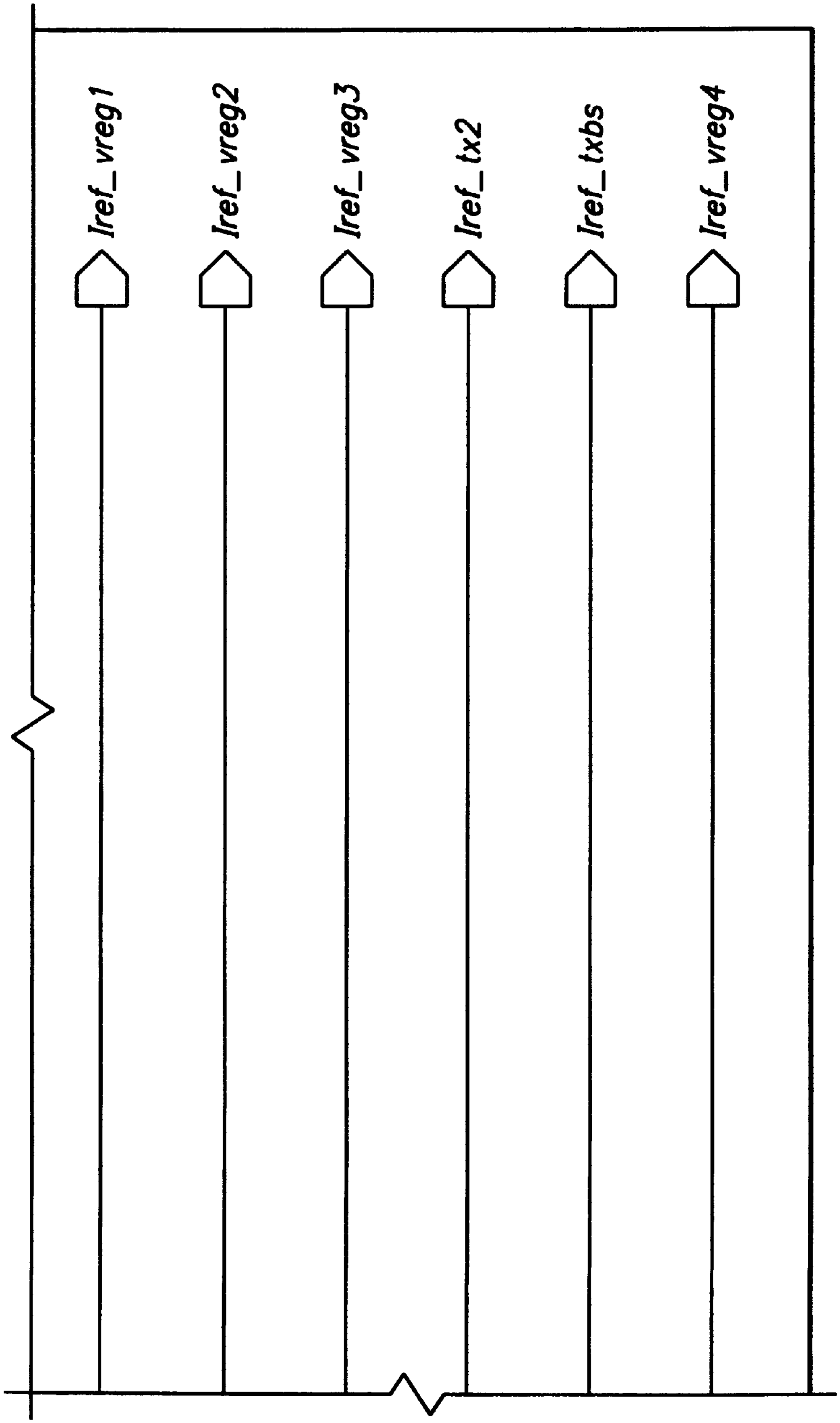
Fig. 9.0303CF

| | | | | |
|---|---|---|---|---|
| 9.04AA | 9.04AB | 9.04AC | 9.04AD | 9.04AE |
| 9.04BA | 9.04BB | 9.04BC | 9.04BD | 9.04BE |
| 9.04CA | 9.04CB | 9.04CC | 9.04CD | 9.04CE |

Fig. 9.04

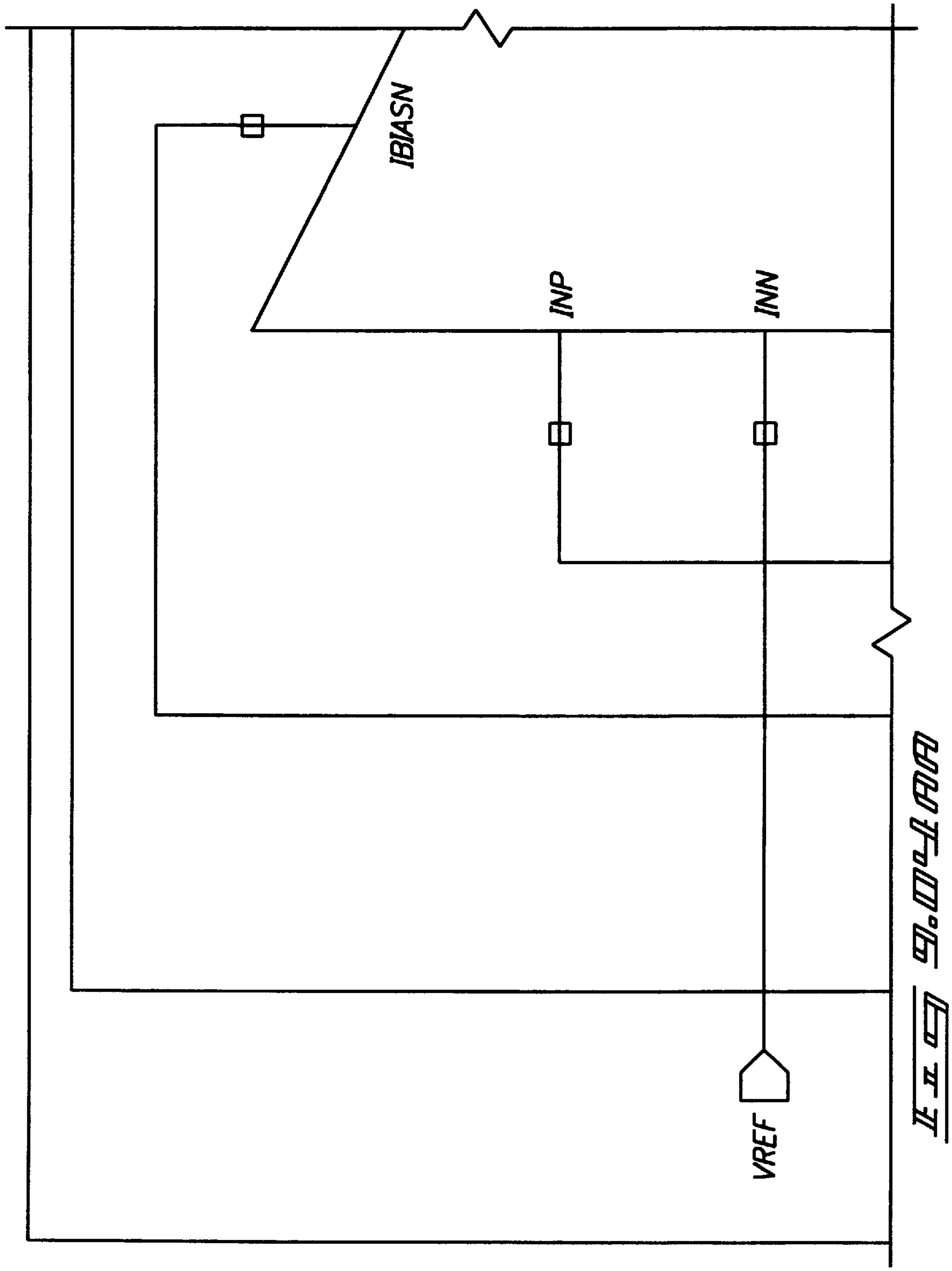
Fig. 9.04AA

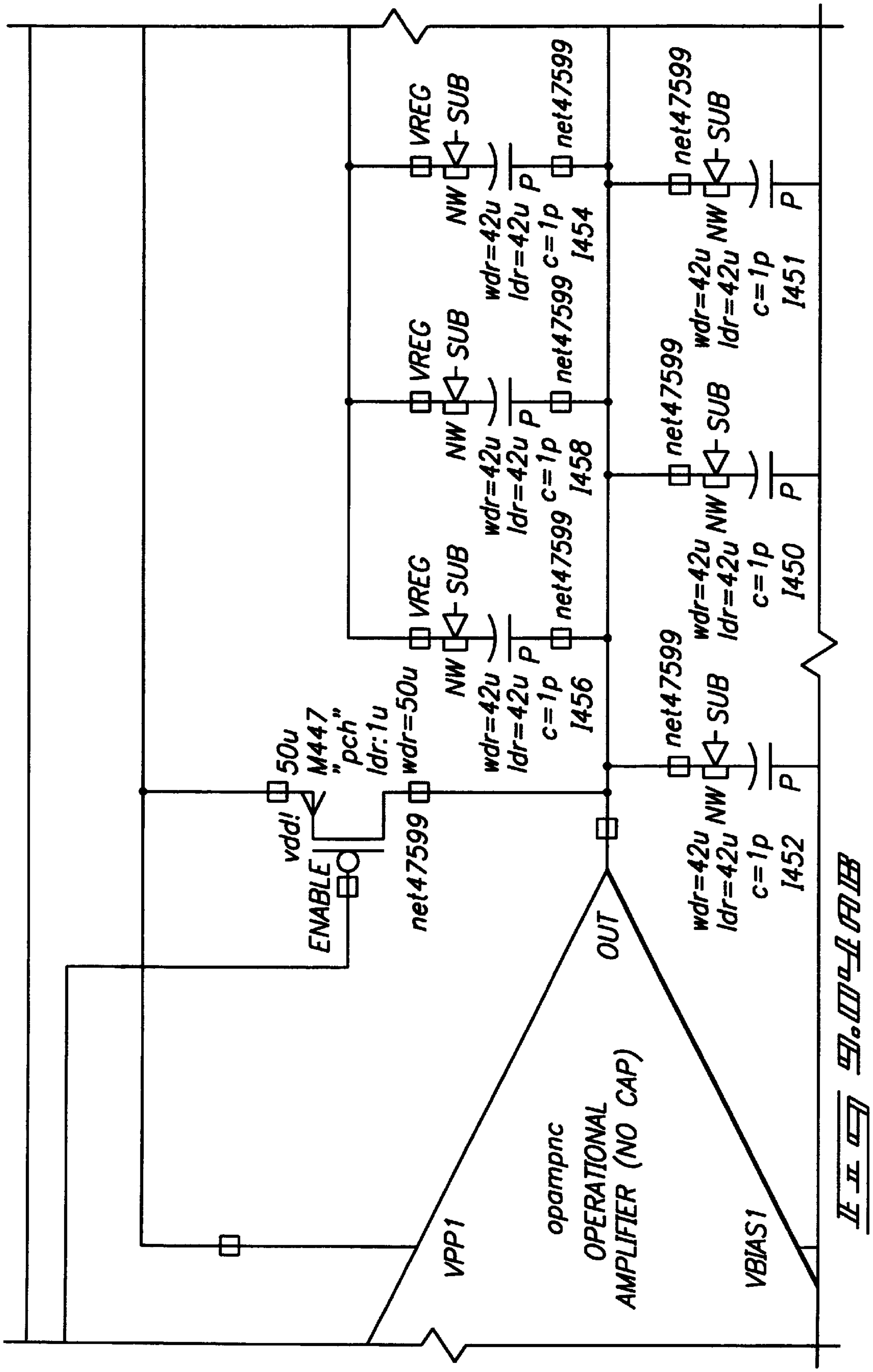
opampnc
OPERATIONAL AMPLIFIER (NO CAP)
VPP1
VBIAS1
OUT
vdd!
ENABLE
net47599
50u
M447
"pch"
ldr:1u
wdr=50u
VREG
SUB
NW
P
net47599
wdr=42u
ldr=42u
c=1p
I456
I458
I454
I452
I450
I451

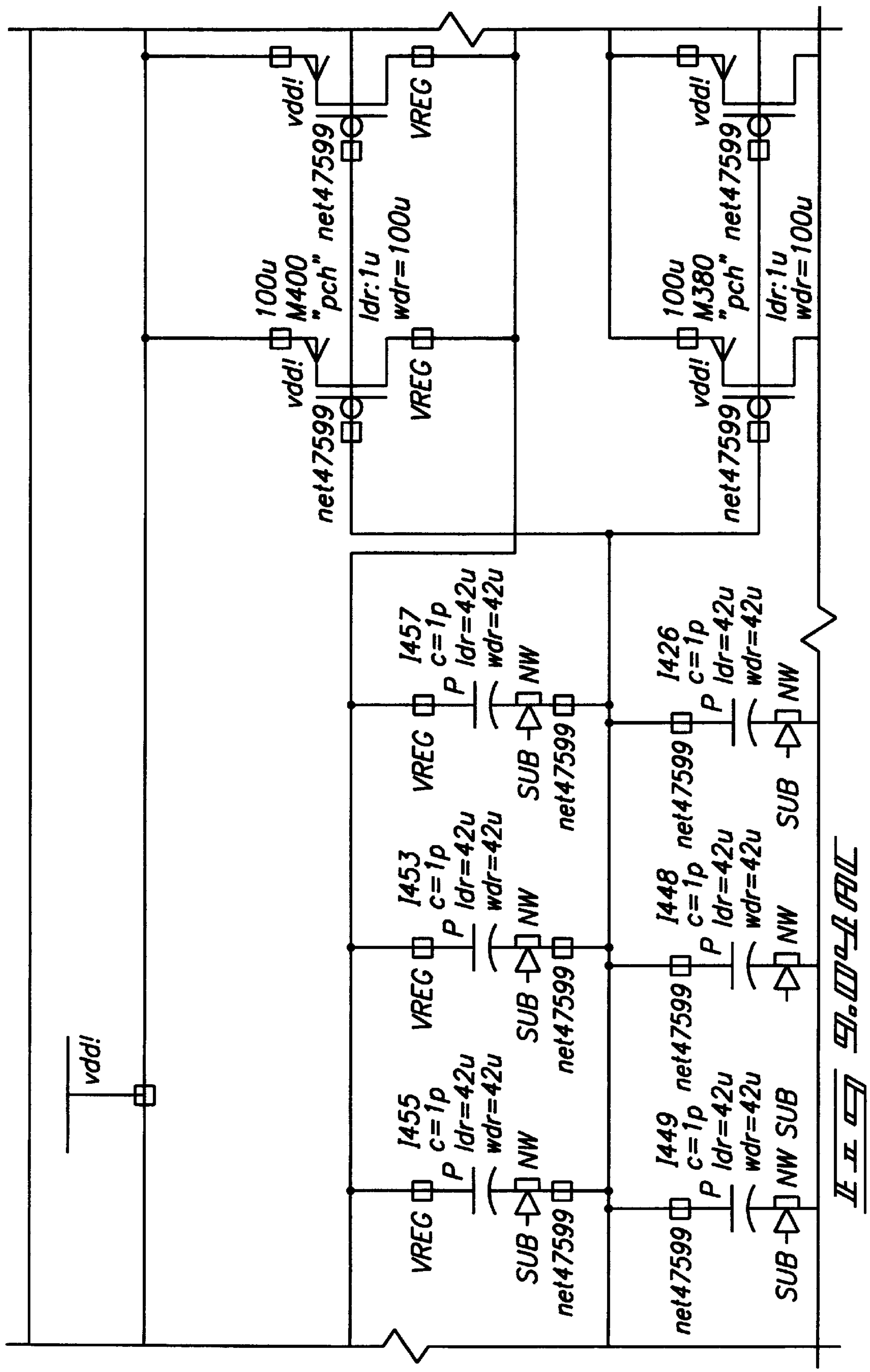
FIG. 9.00.4AC

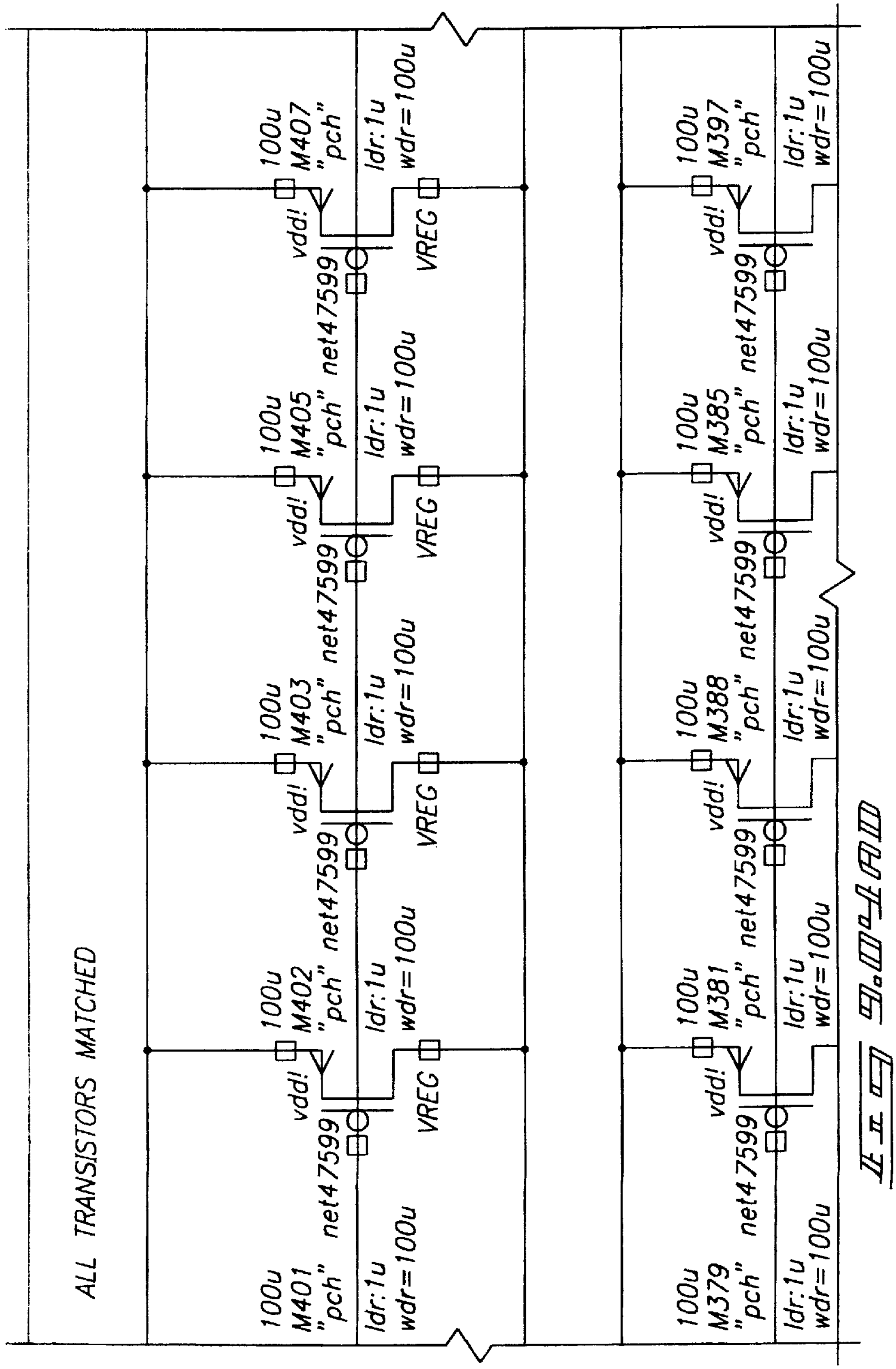
ALL TRANSISTORS MATCHED
100u
M401
"pch"
ldr:1u
wdr=100u
net47599
vdd!
VREG
100u
M402
"pch"
ldr:1u
wdr=100u
100u
M403
"pch"
ldr:1u
wdr=100u
100u
M405
"pch"
ldr:1u
wdr=100u
100u
M407
"pch"
ldr:1u
wdr=100u
100u
M379
"pch"
ldr:1u
wdr=100u
100u
M381
"pch"
ldr:1u
wdr=100u
100u
M388
"pch"
ldr:1u
wdr=100u
100u
M385
"pch"
ldr:1u
wdr=100u
100u
M397
"pch"
ldr:1u
wdr=100u

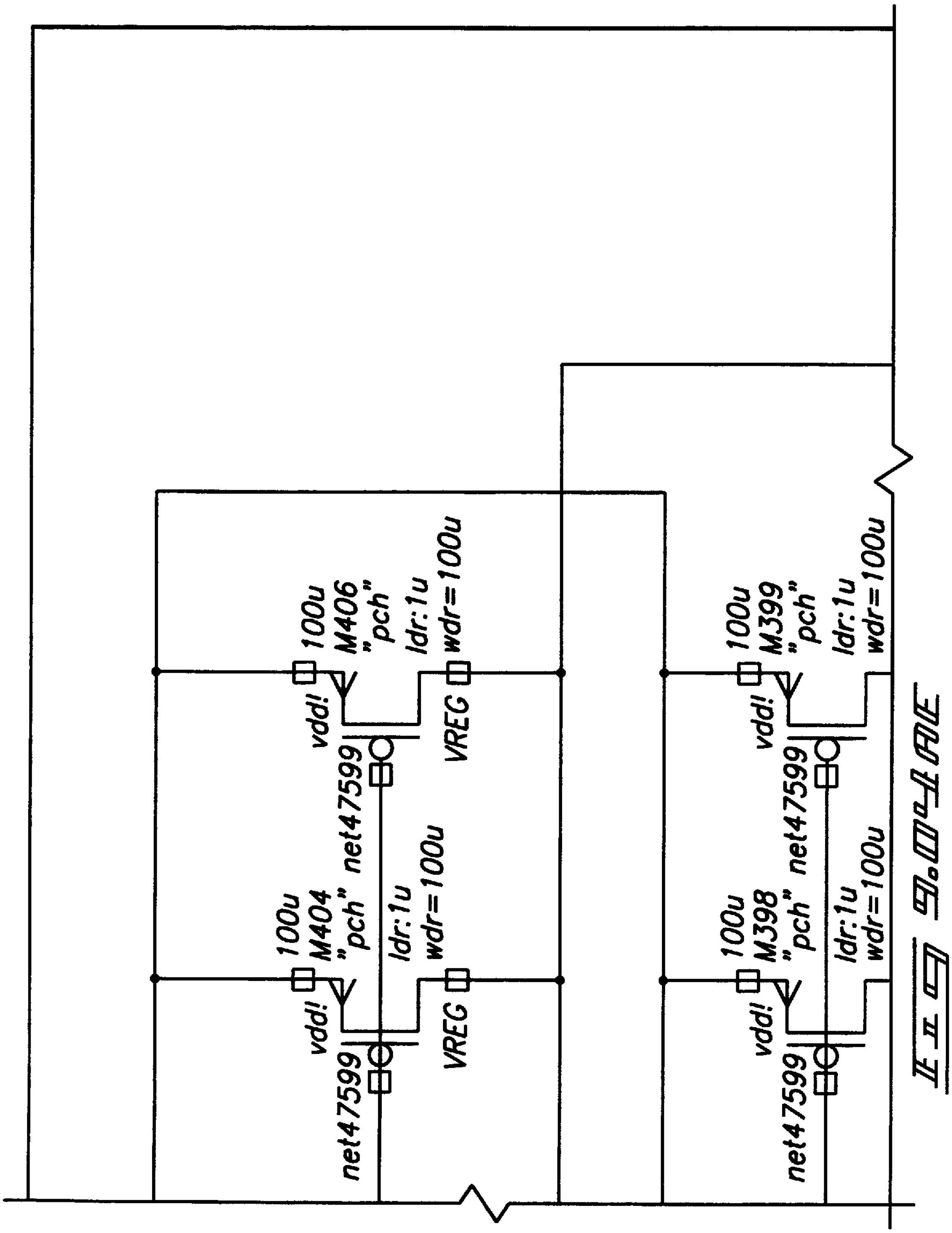
FIG. 9.004AE

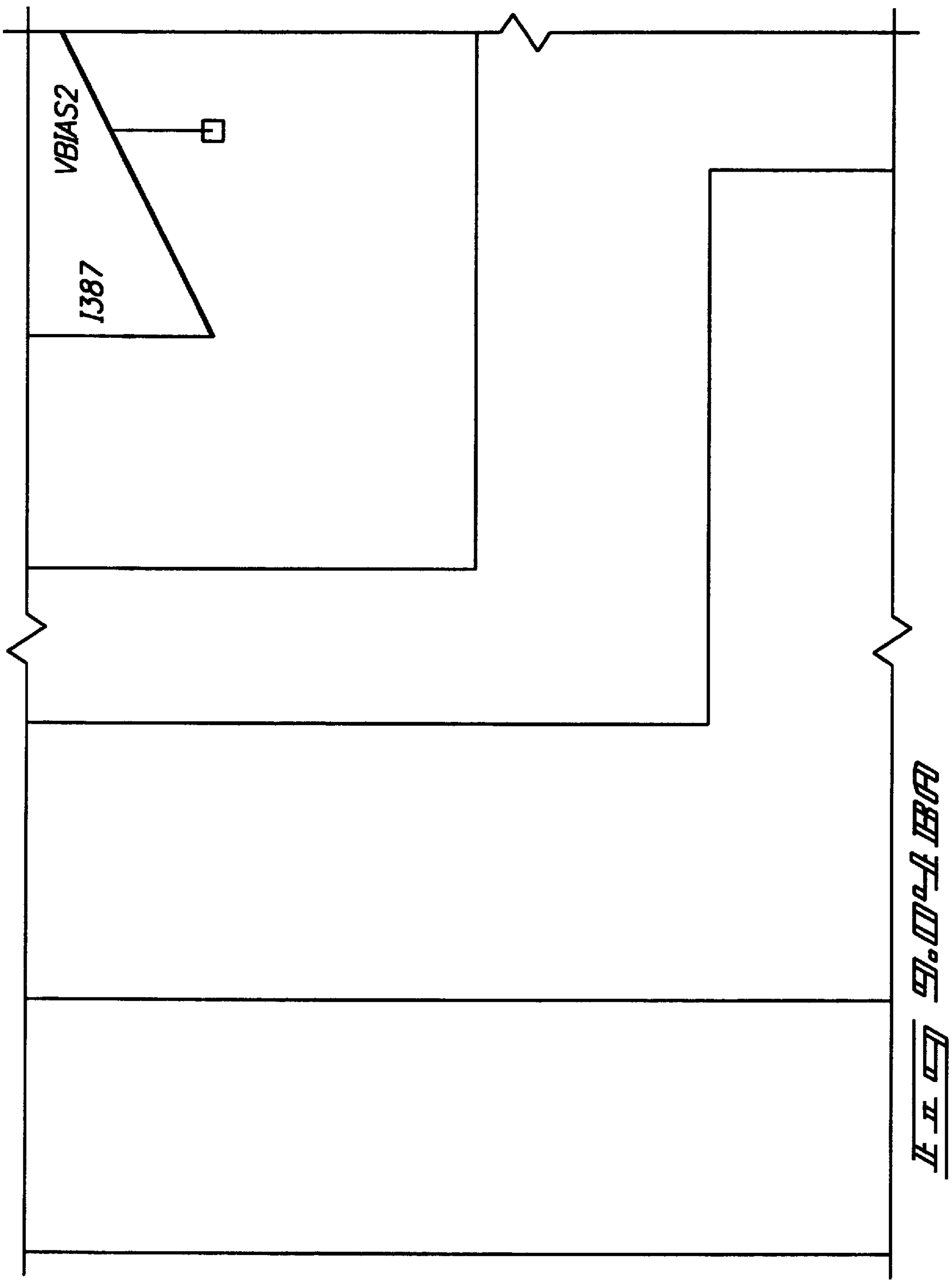
FIG. 9.04BA

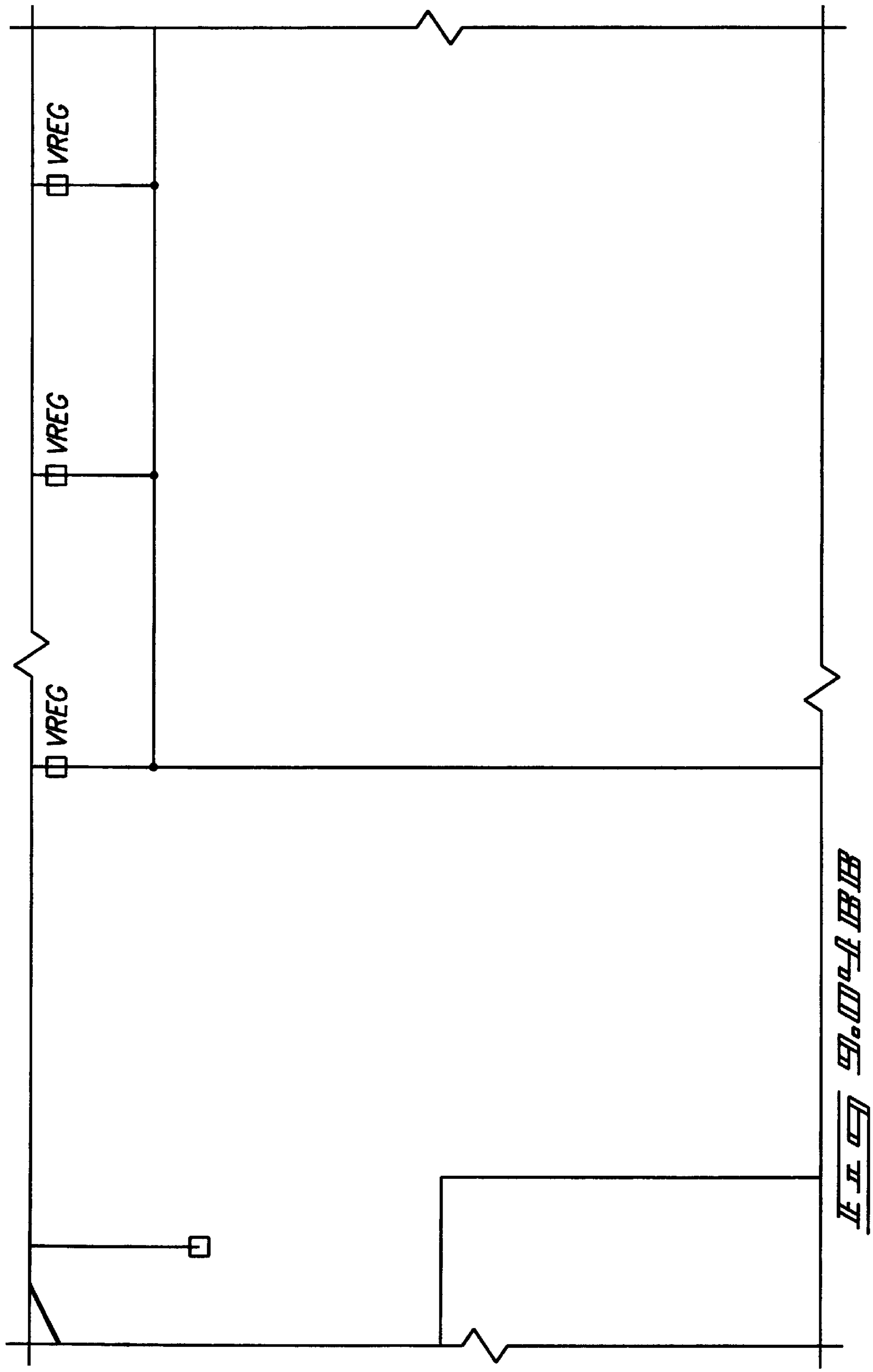
FIG. 9.07BB

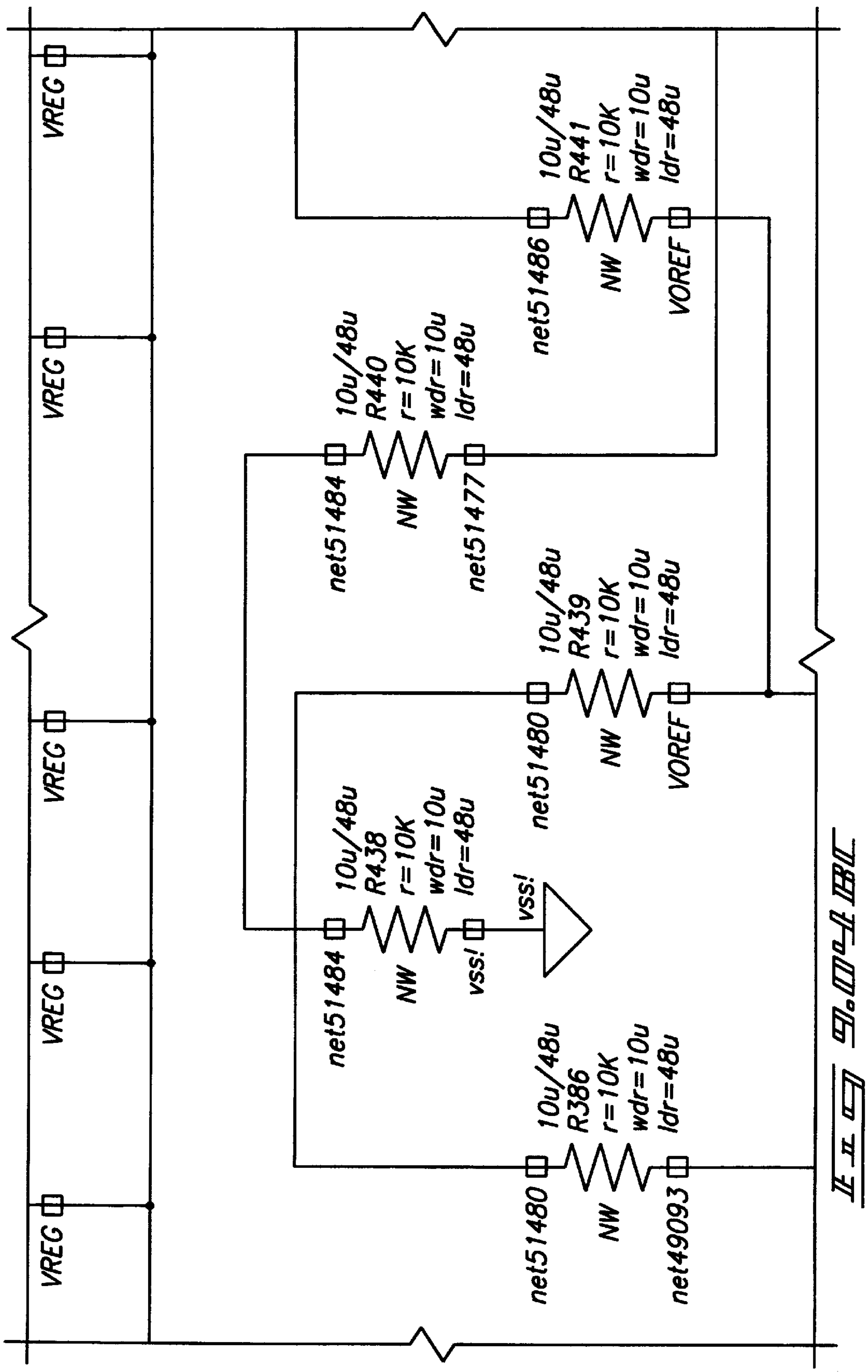
VREG
VREG
VREG
VREG
VREG
10u/48u
R441
r=10K
wdr=10u
ldr=48u
net51486
NW
VOREF
10u/48u
R440
r=10K
wdr=10u
ldr=48u
net51484
NW
net51477
10u/48u
R439
r=10K
wdr=10u
ldr=48u
net51480
NW
VOREF
10u/48u
R438
r=10K
wdr=10u
ldr=48u
net51484
NW
vss!
vss!
10u/48u
R386
r=10K
wdr=10u
ldr=48u
net51480
NW
net49093

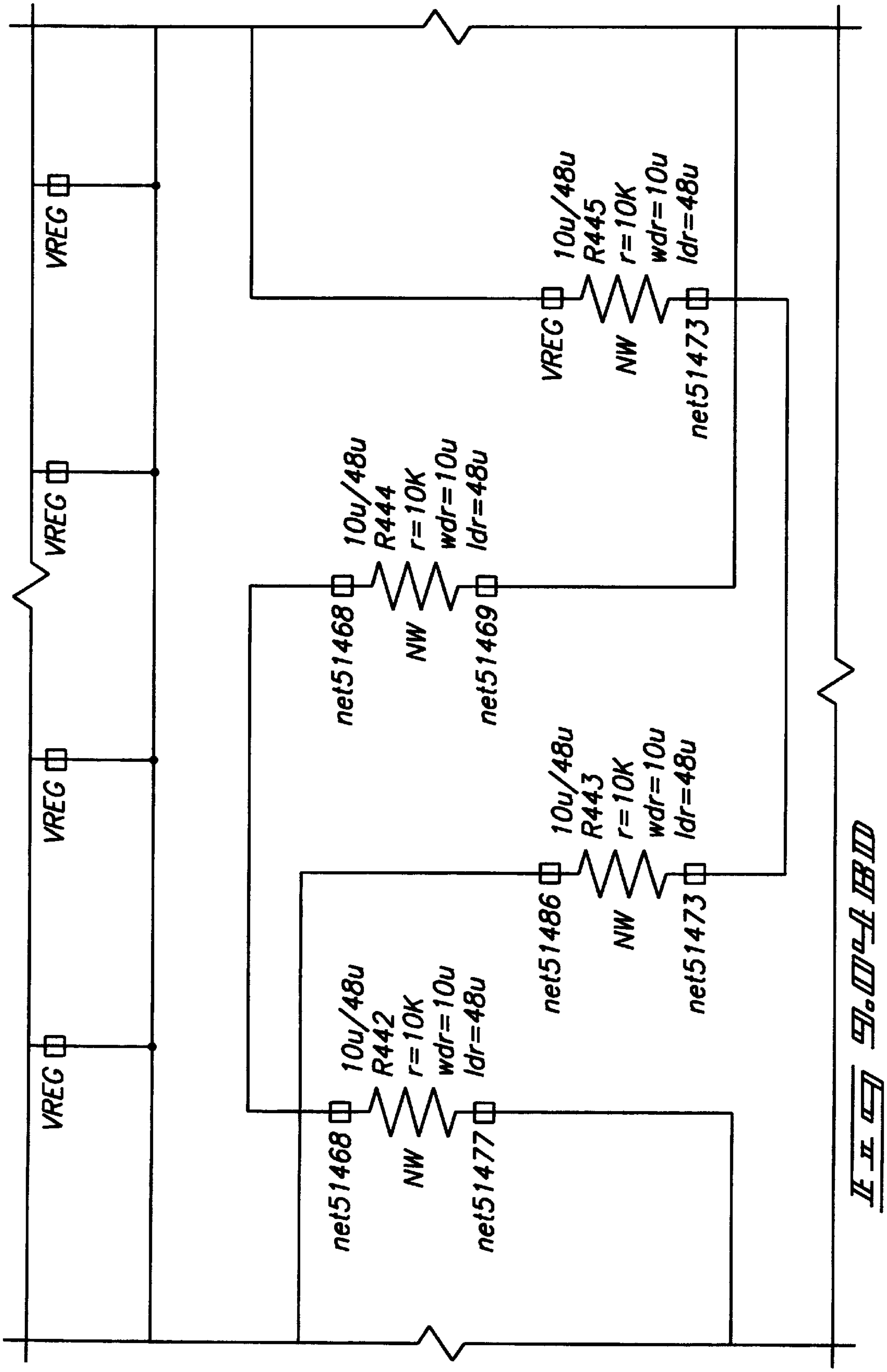
Fig. 6.07BD

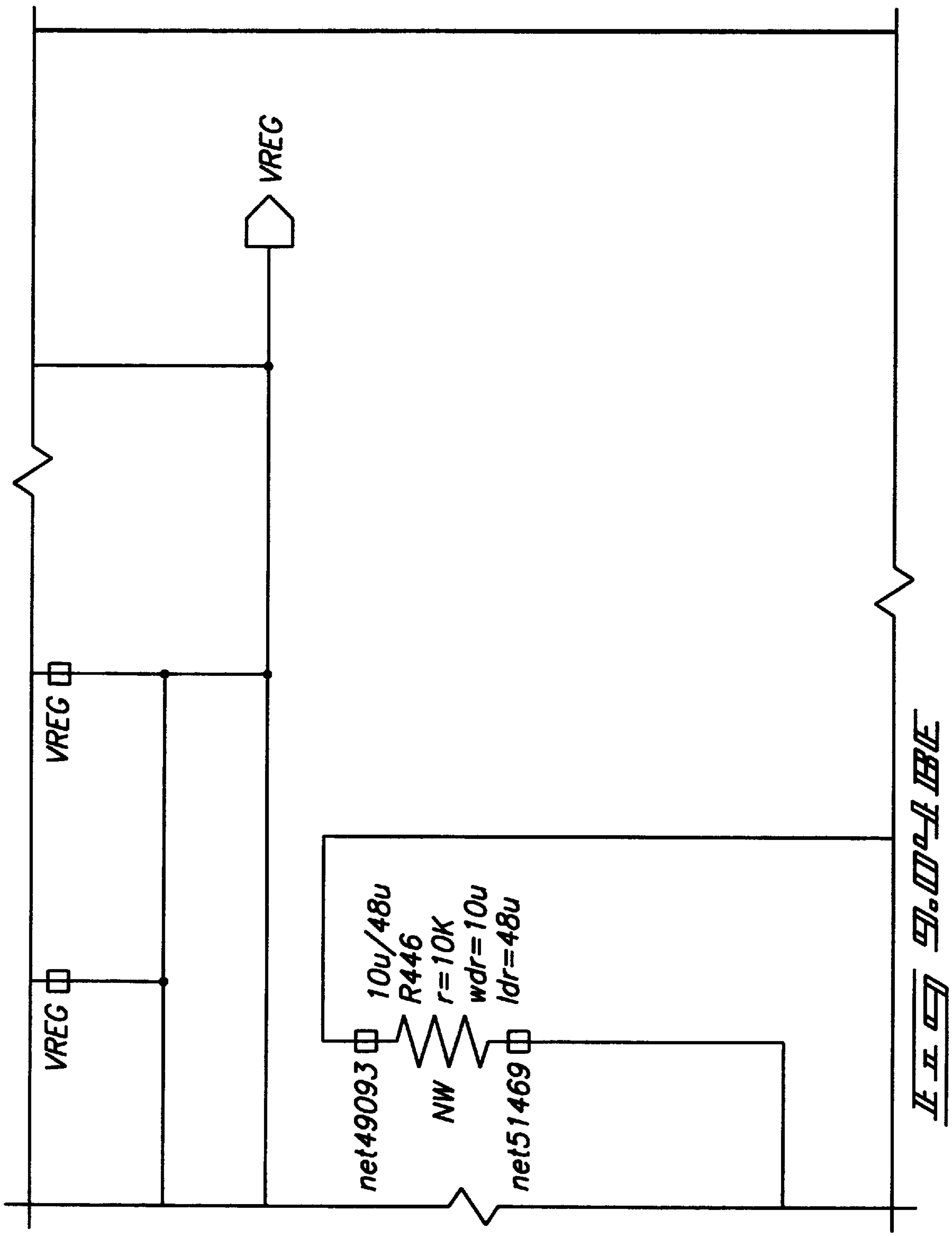
Fig. 9.04BE

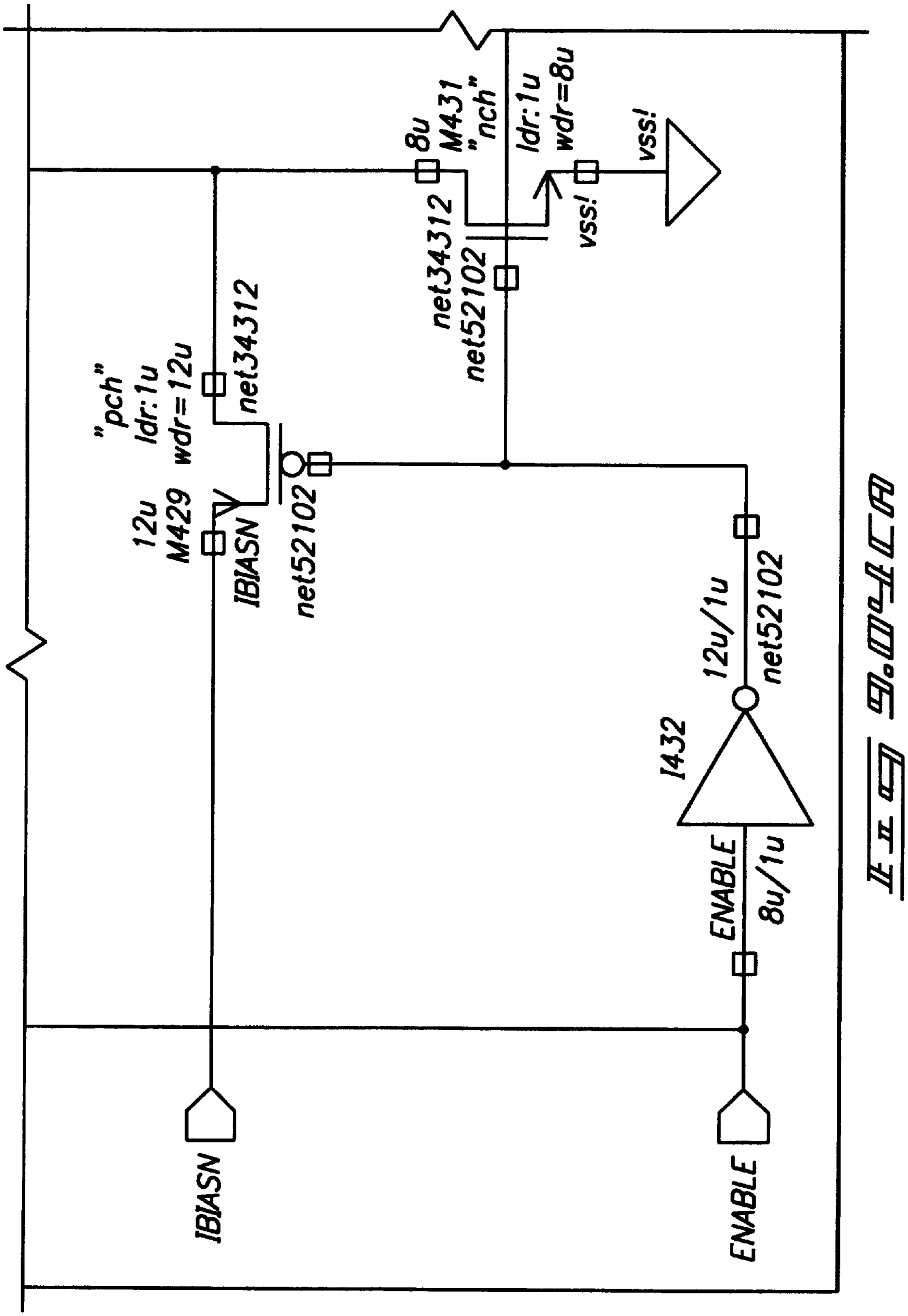
Fig. 9.04CA

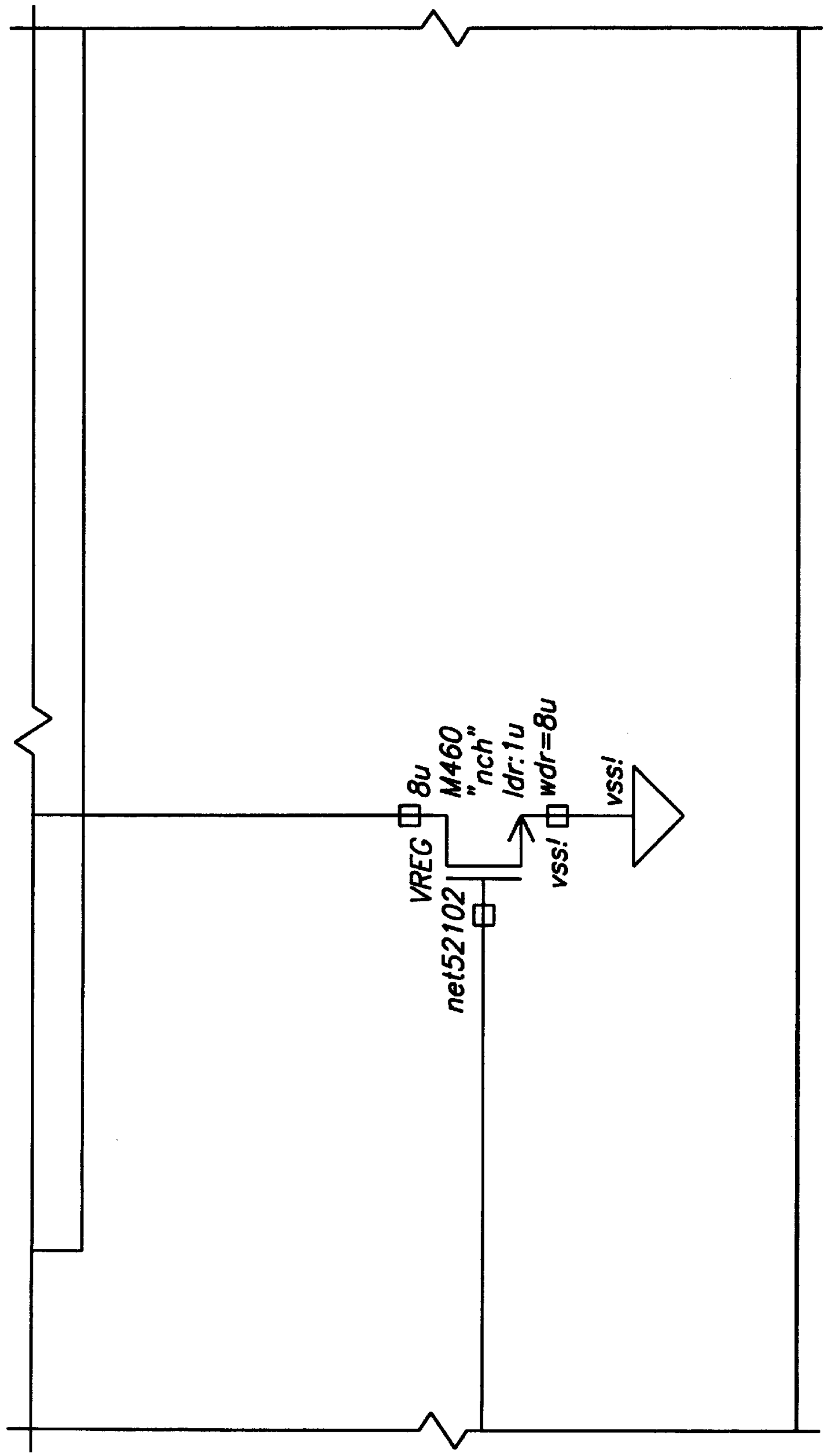
FIG. 9.04CB

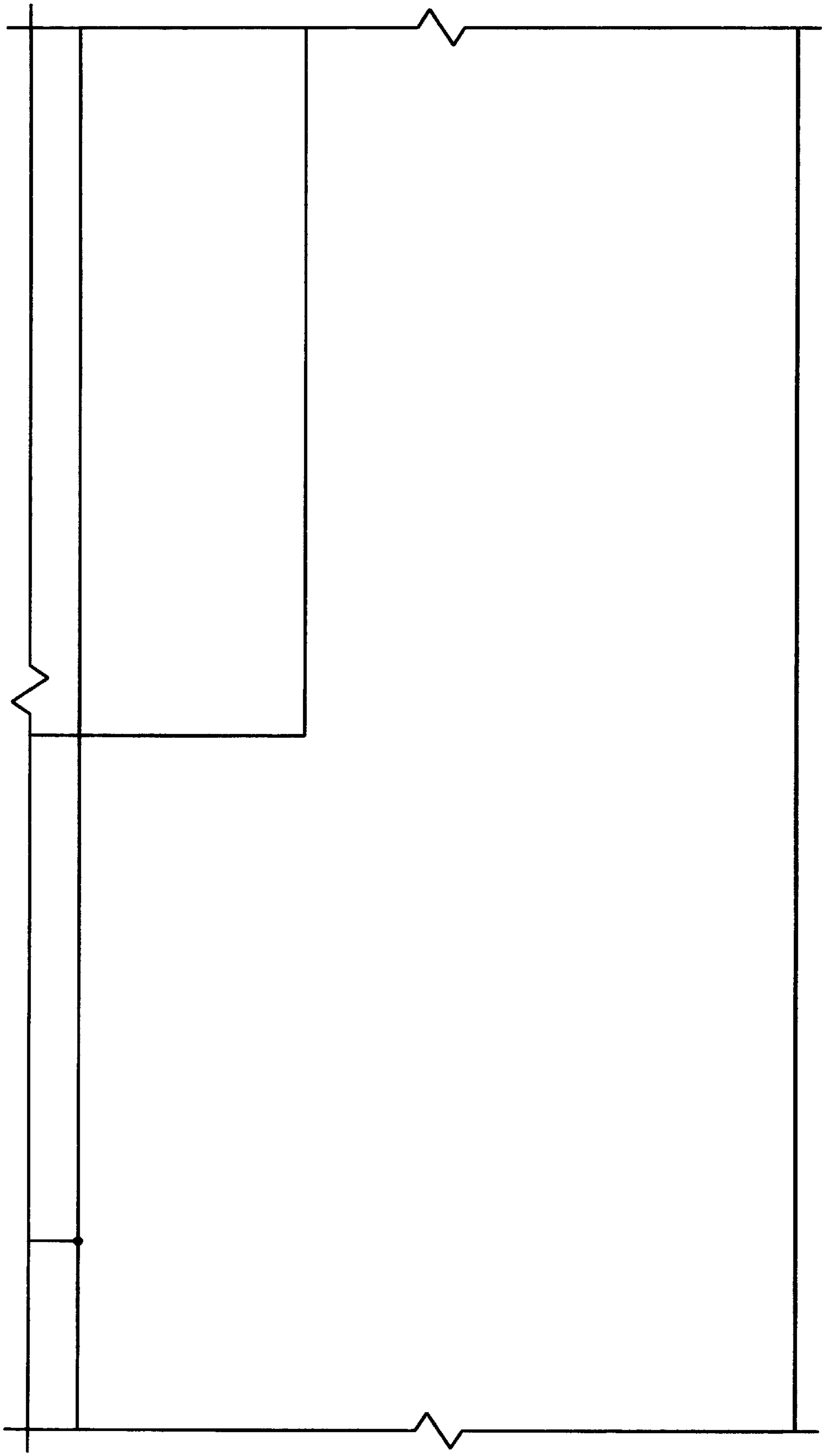
Fig. 9D4JJ

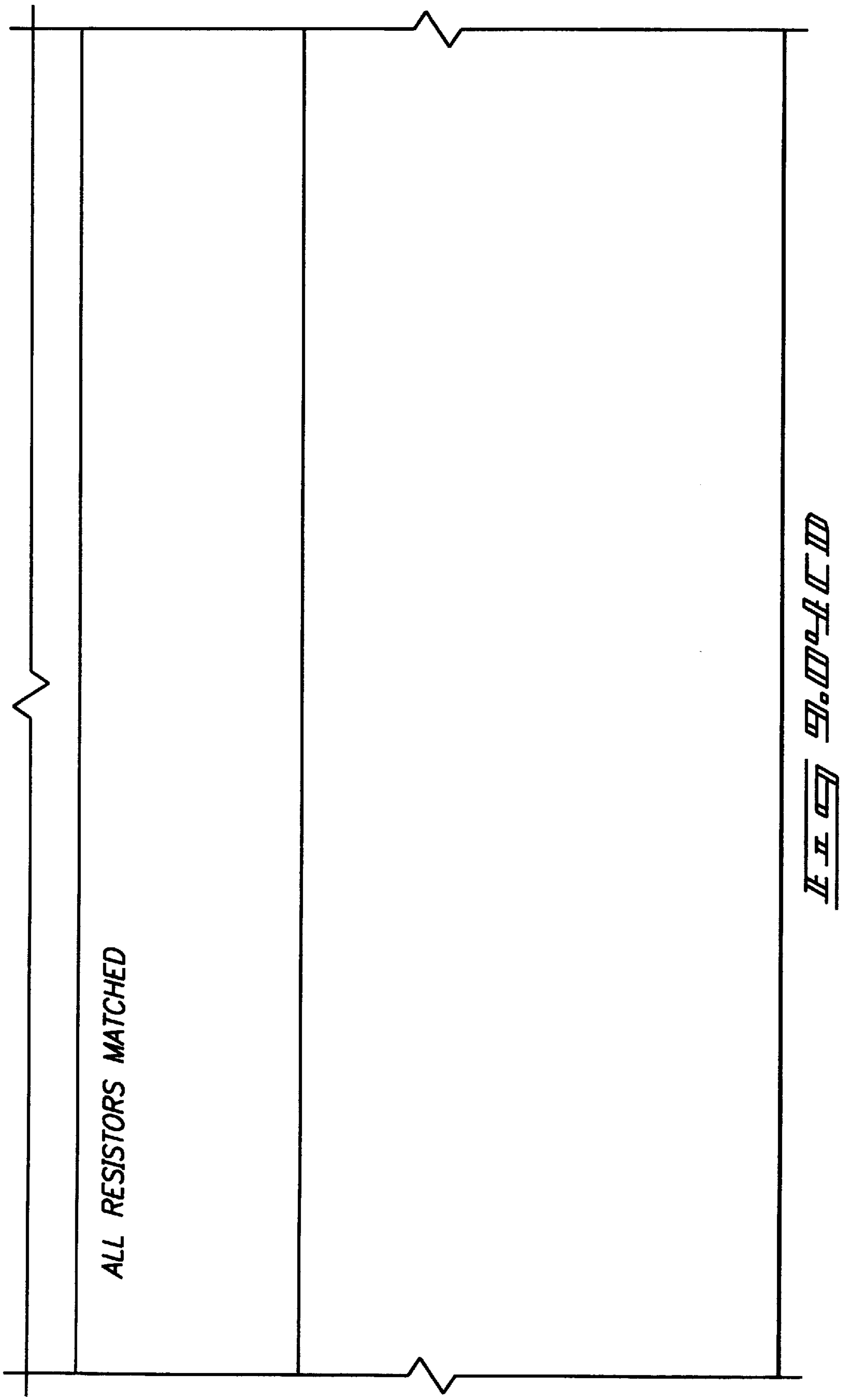
Fig. 9.04CD

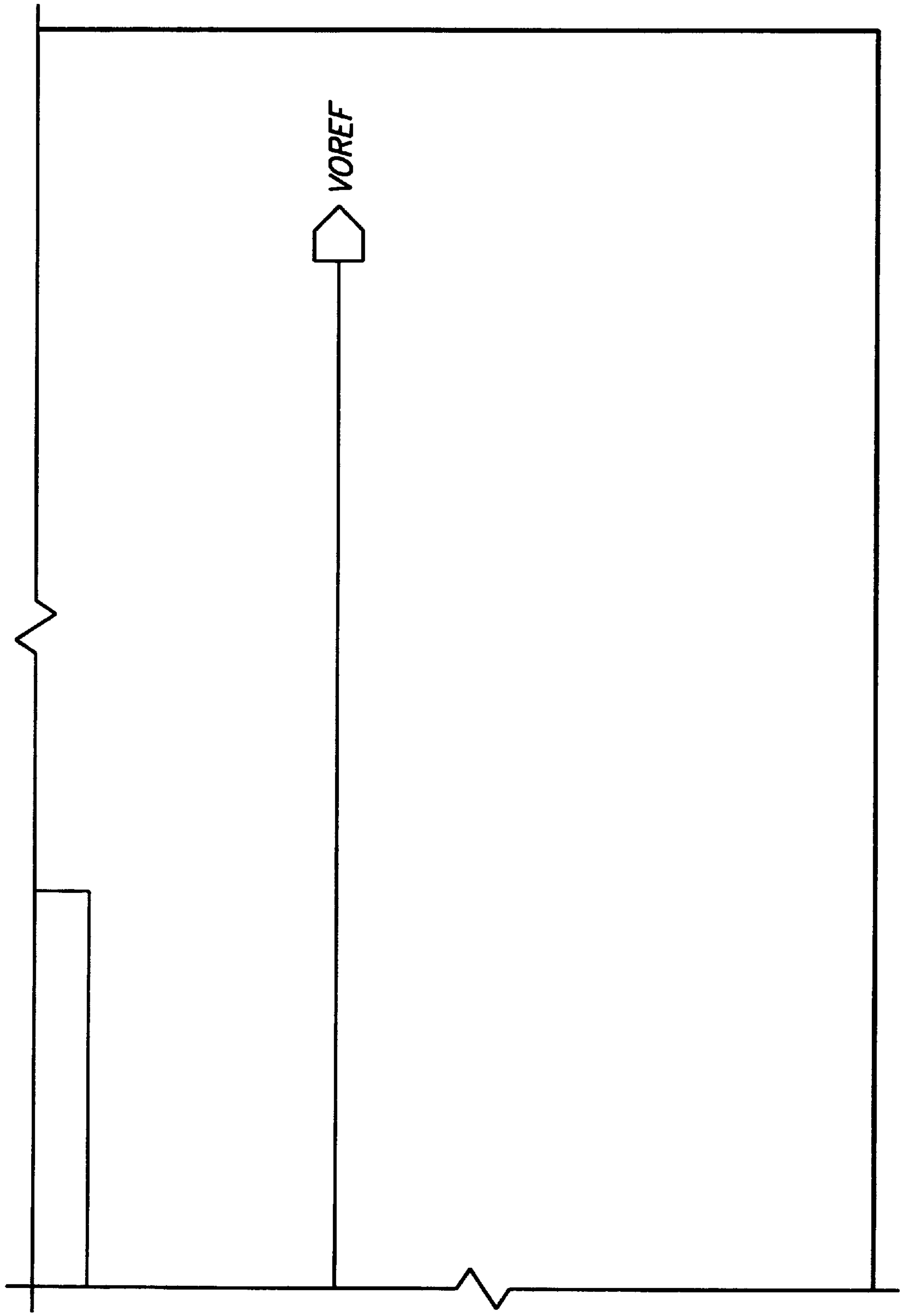
Fig. 9.04CE

| | | | | |
|---|---|---|---|---|
| 9.05AA | 9.05AB | 9.05AC | 9.05AD | 9.05AE |
| 9.05BA | 9.05BB | 9.05BC | 9.05BD | 9.05BE |
| 9.05CA | 9.05CB | 9.05CC | 9.05CD | 9.05CE |
| 9.05DA | 9.05DB | 9.05DC | 9.05DD | 9.05DE |
| 9.05EA | 9.05EB | 9.05EC | 9.05ED | 9.05EE |
| 9.05FA | 9.05FB | 9.05FC | 9.05FD | 9.05FE |

Fig 9.05

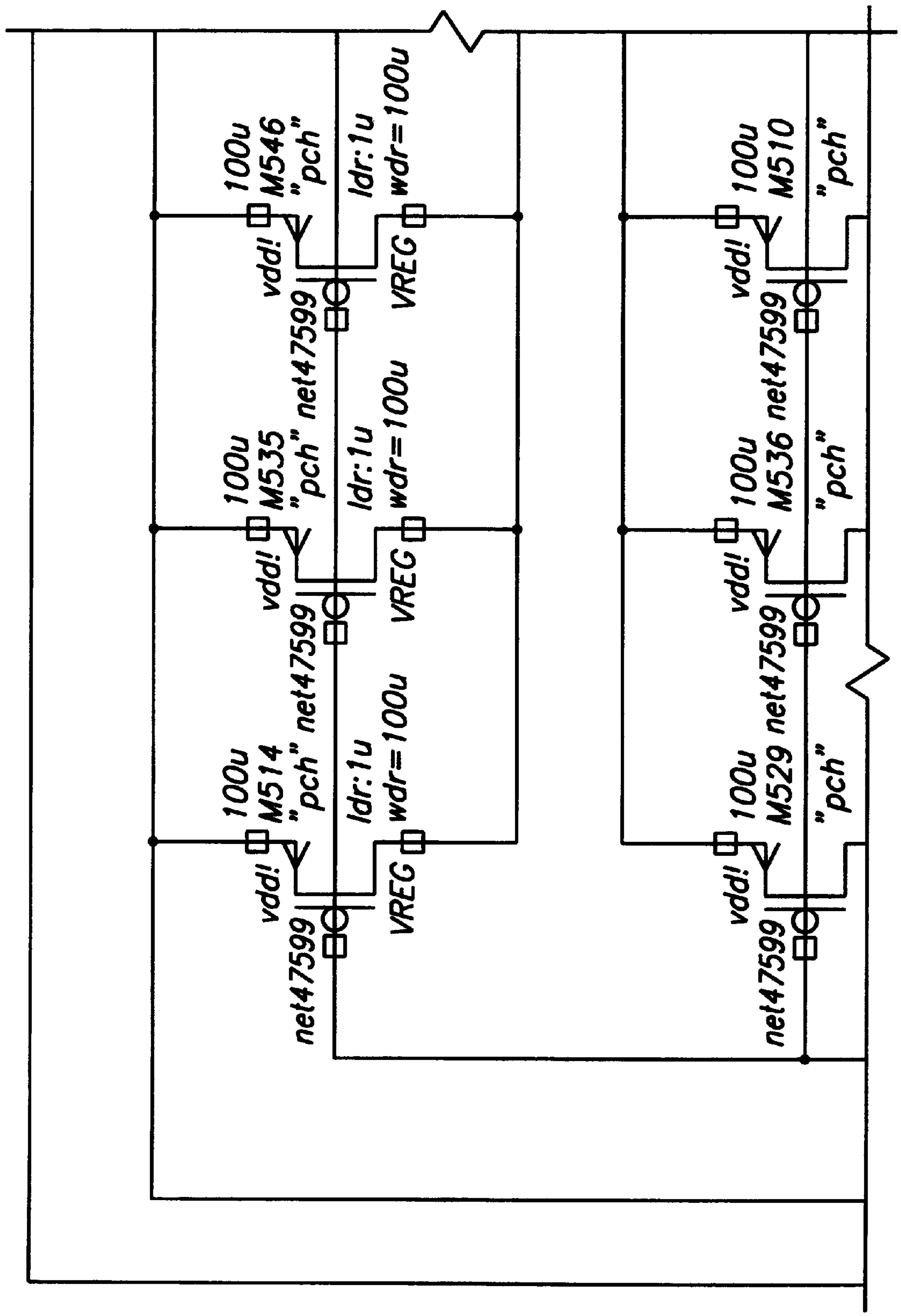
FIG 9.05AA

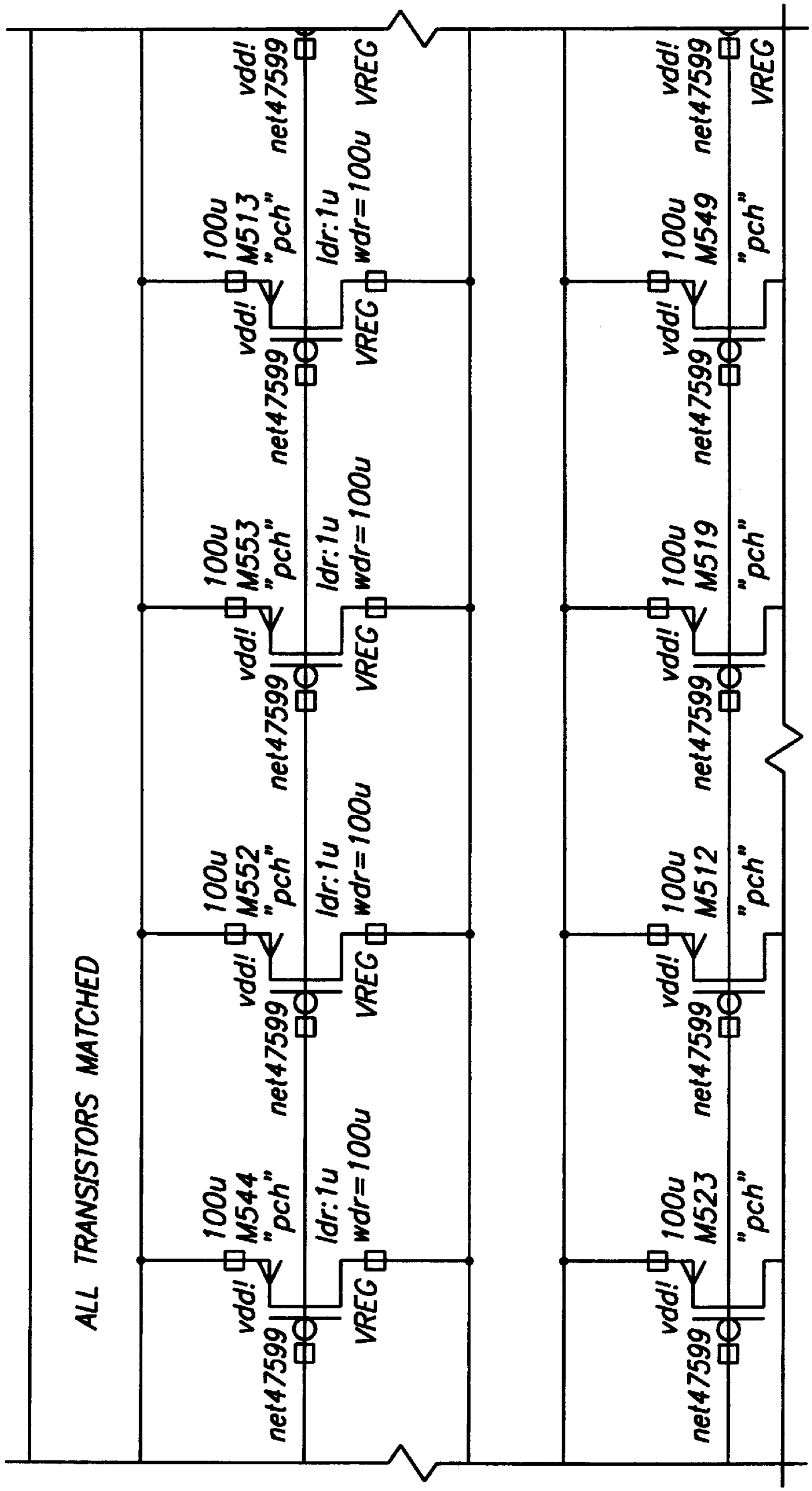
FIG. 9.05AB

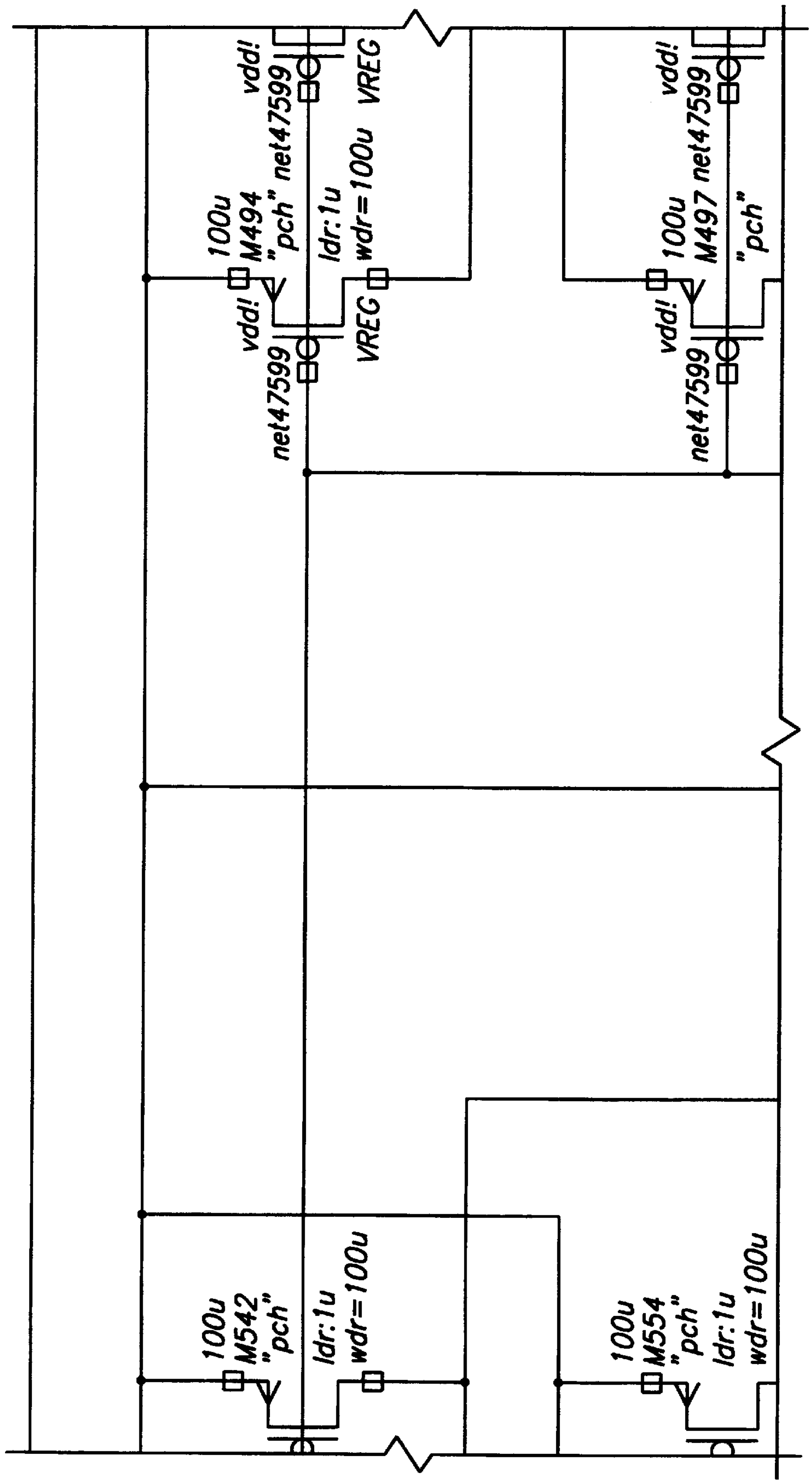
FIG. 9.05AL

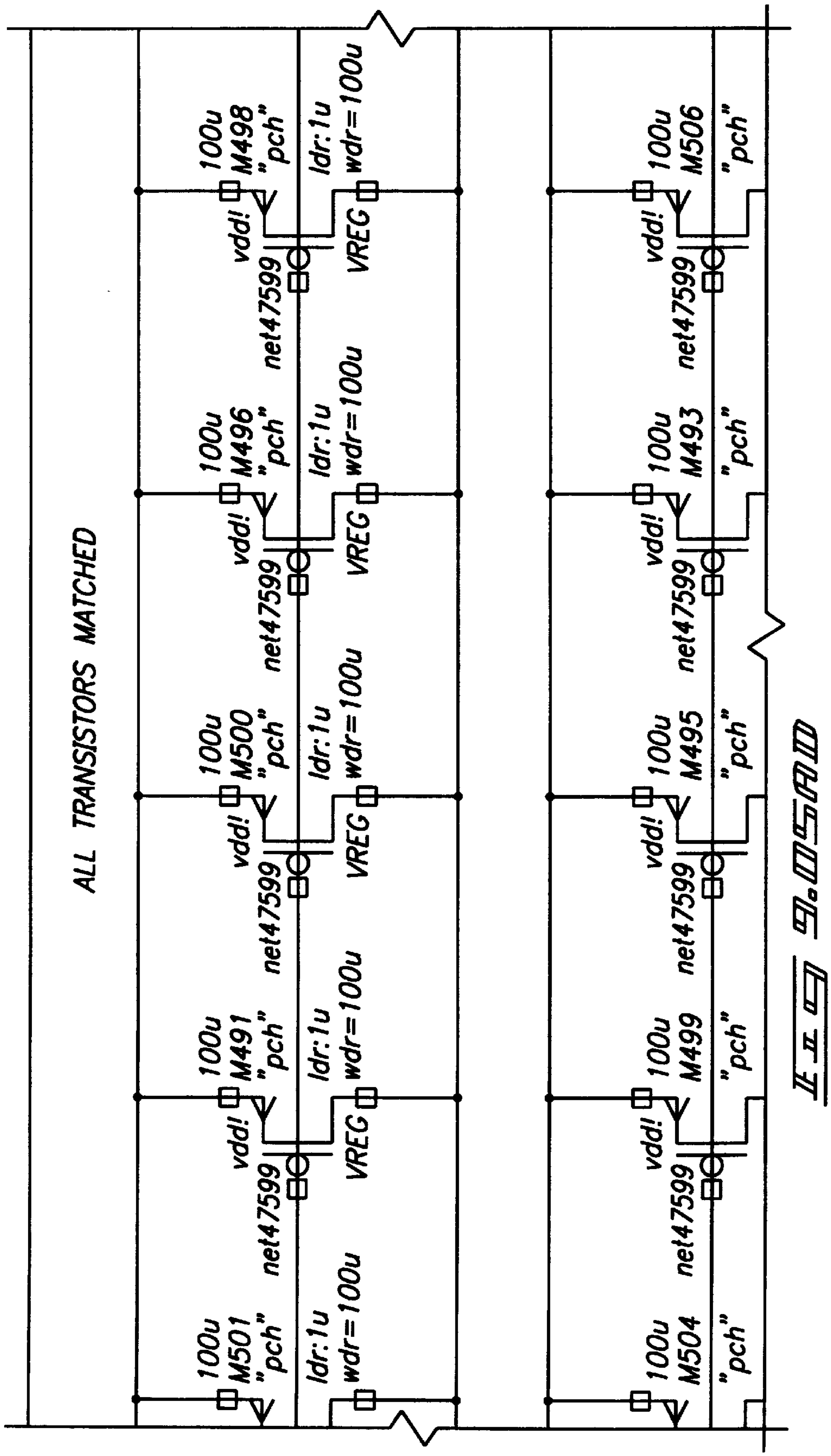
FIG. 9.05AD

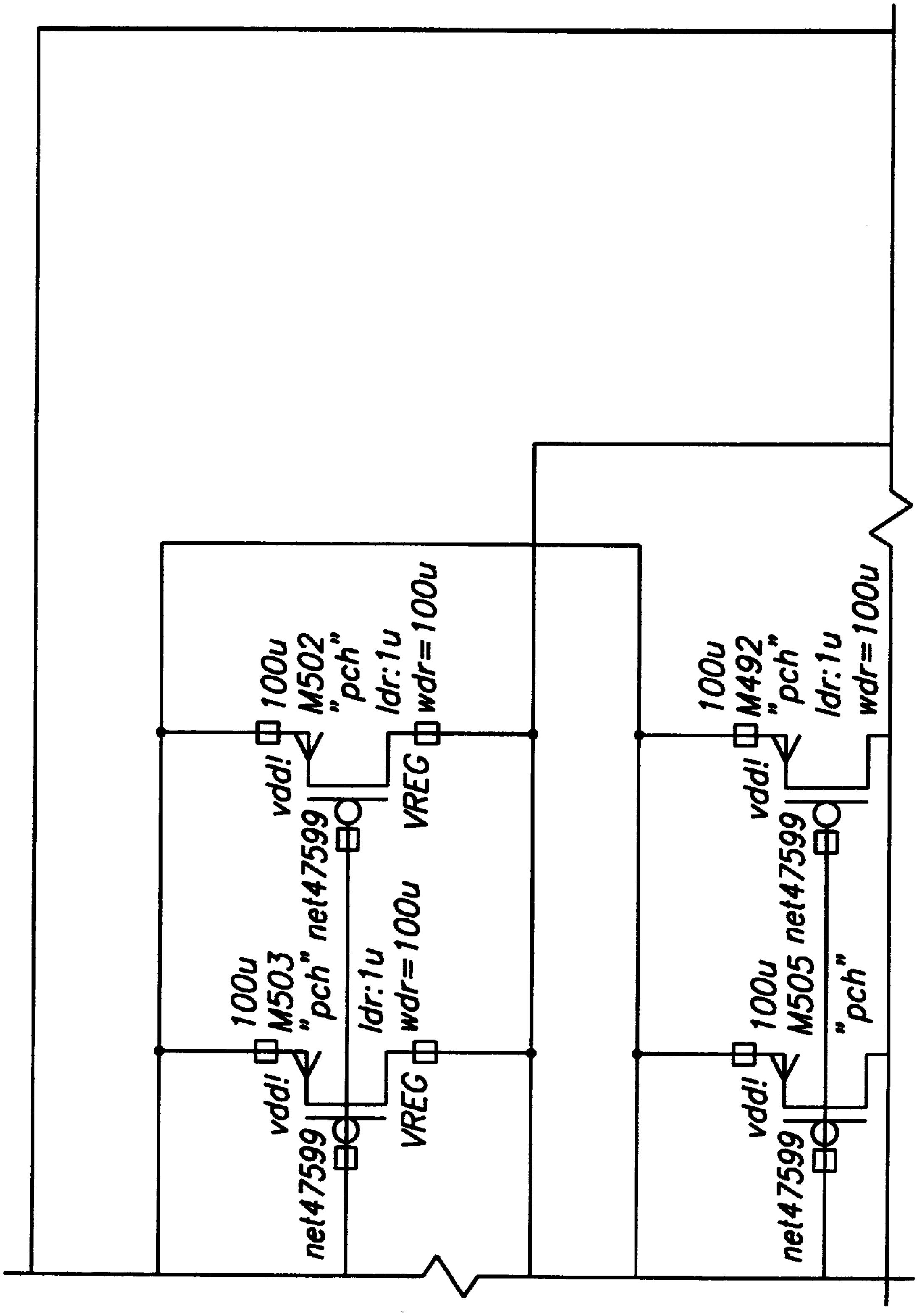
Fig 9.05AE

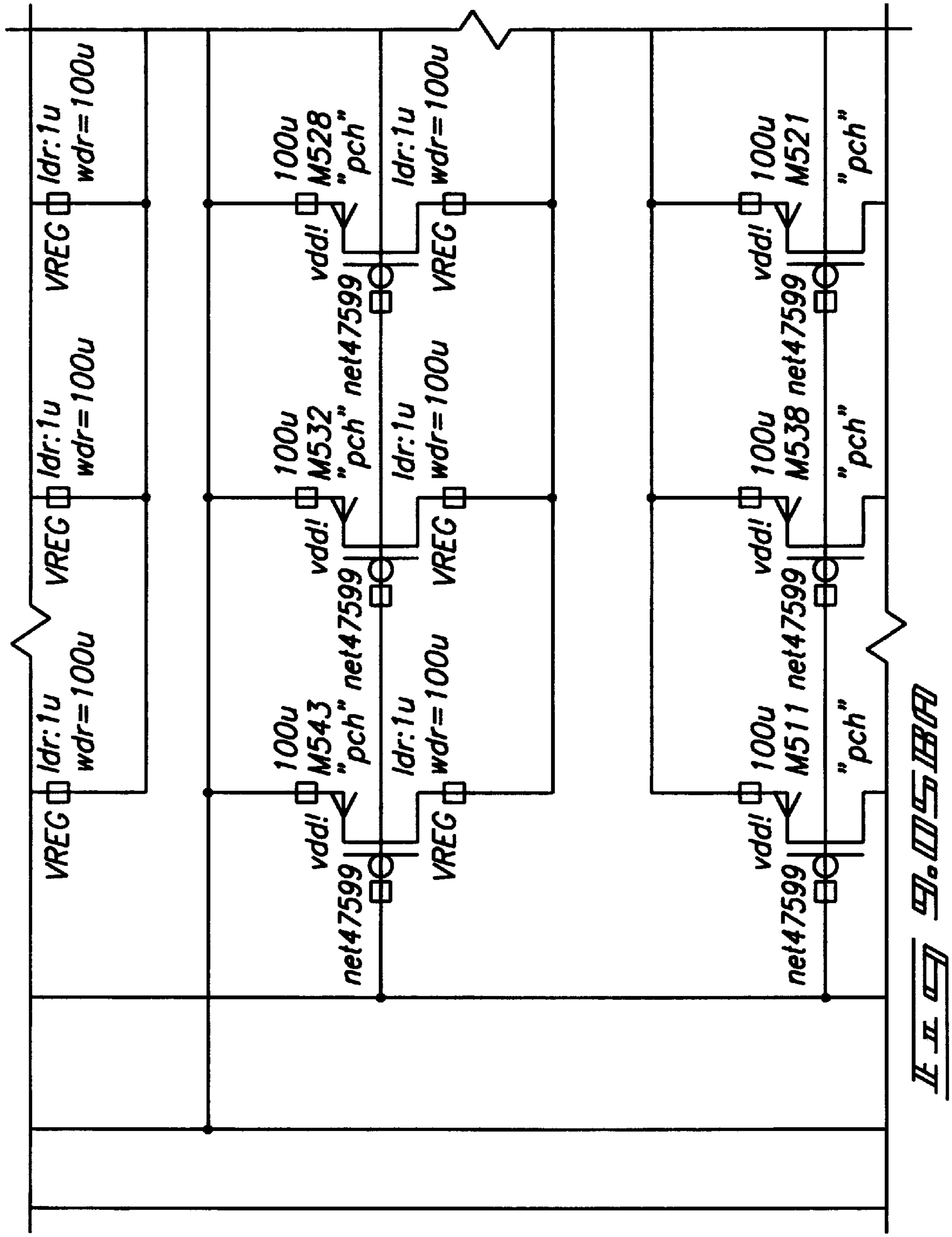
FIG. 9.05BA

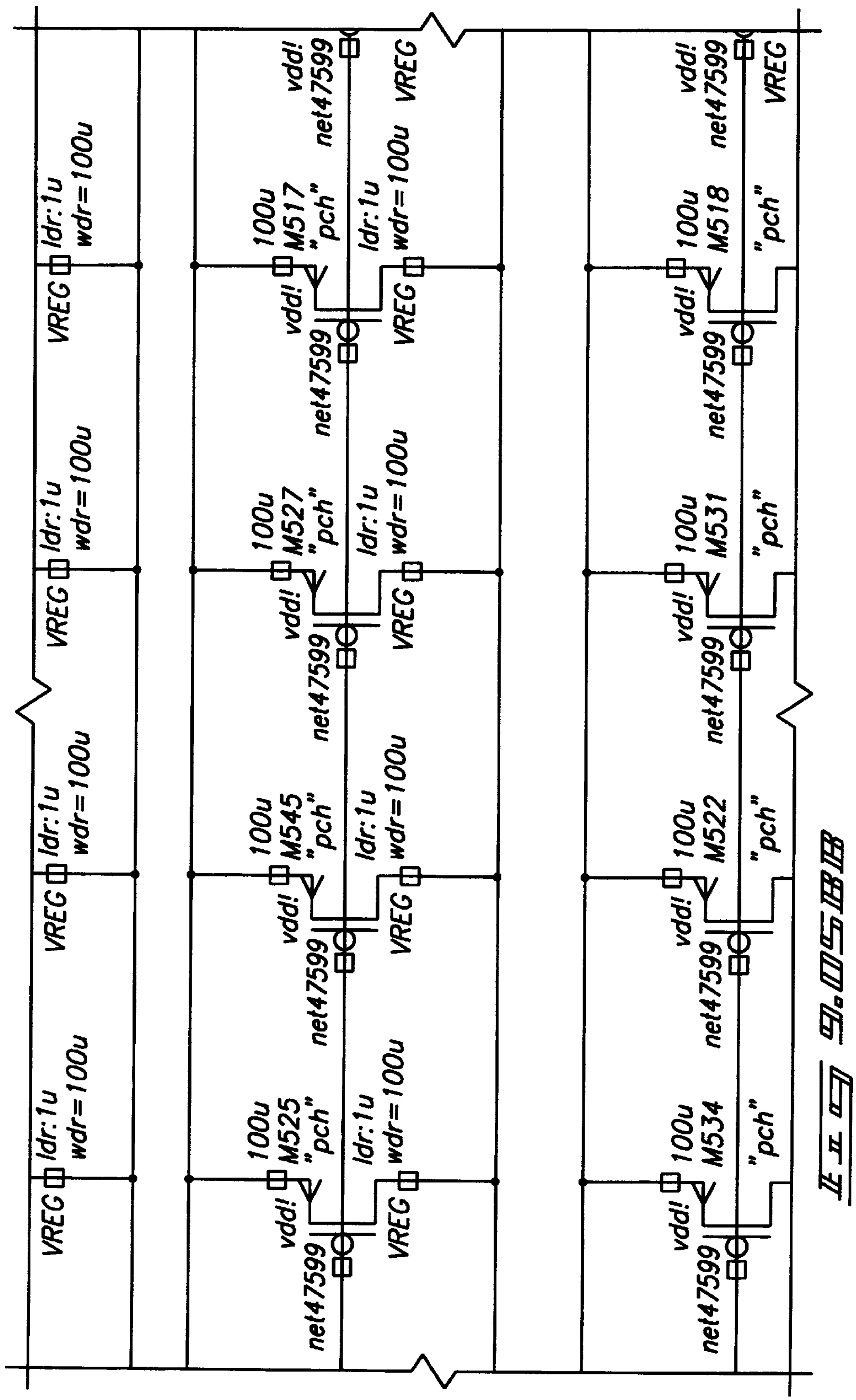
FIG. 9.05BB

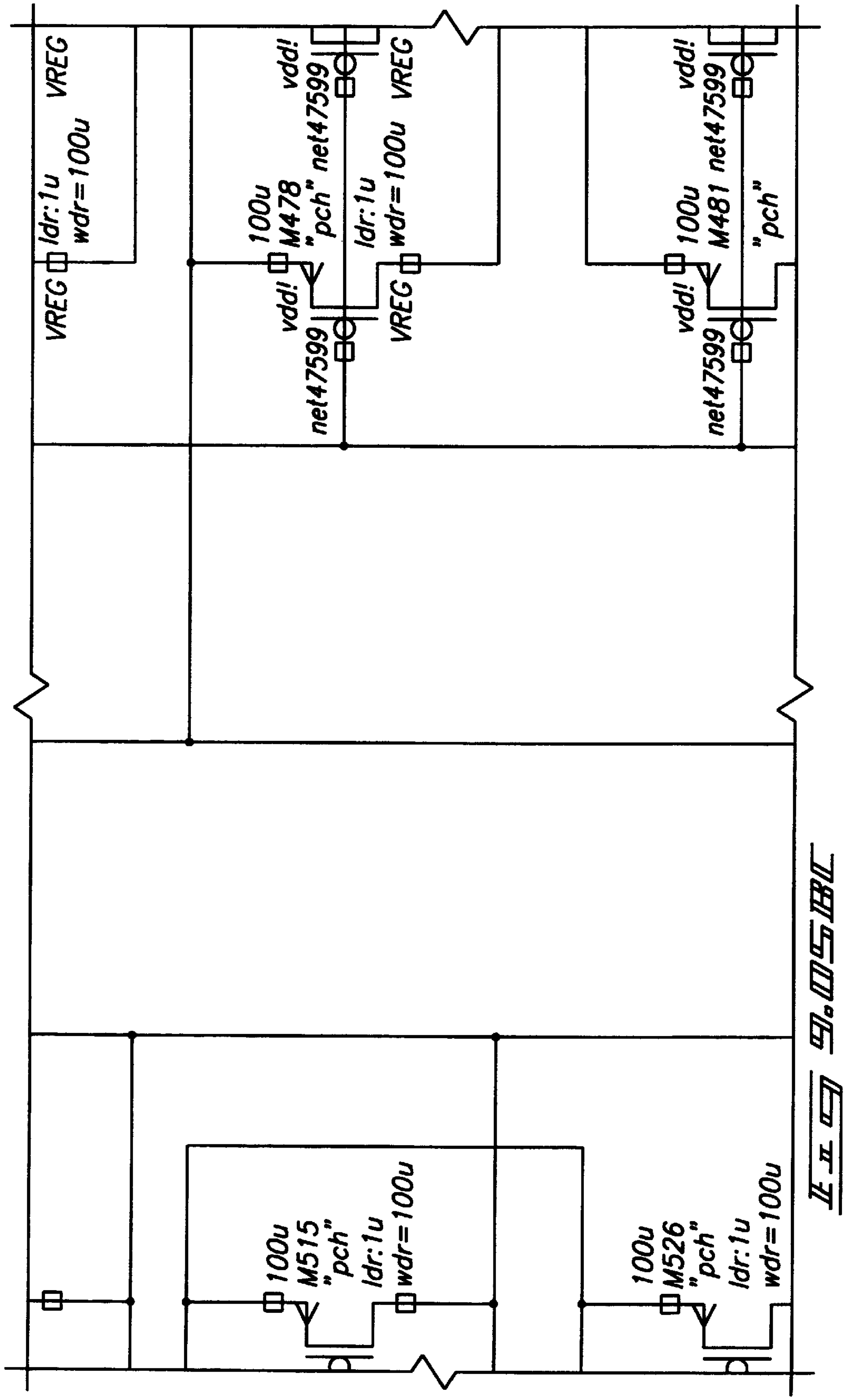
Fig 9.05BL

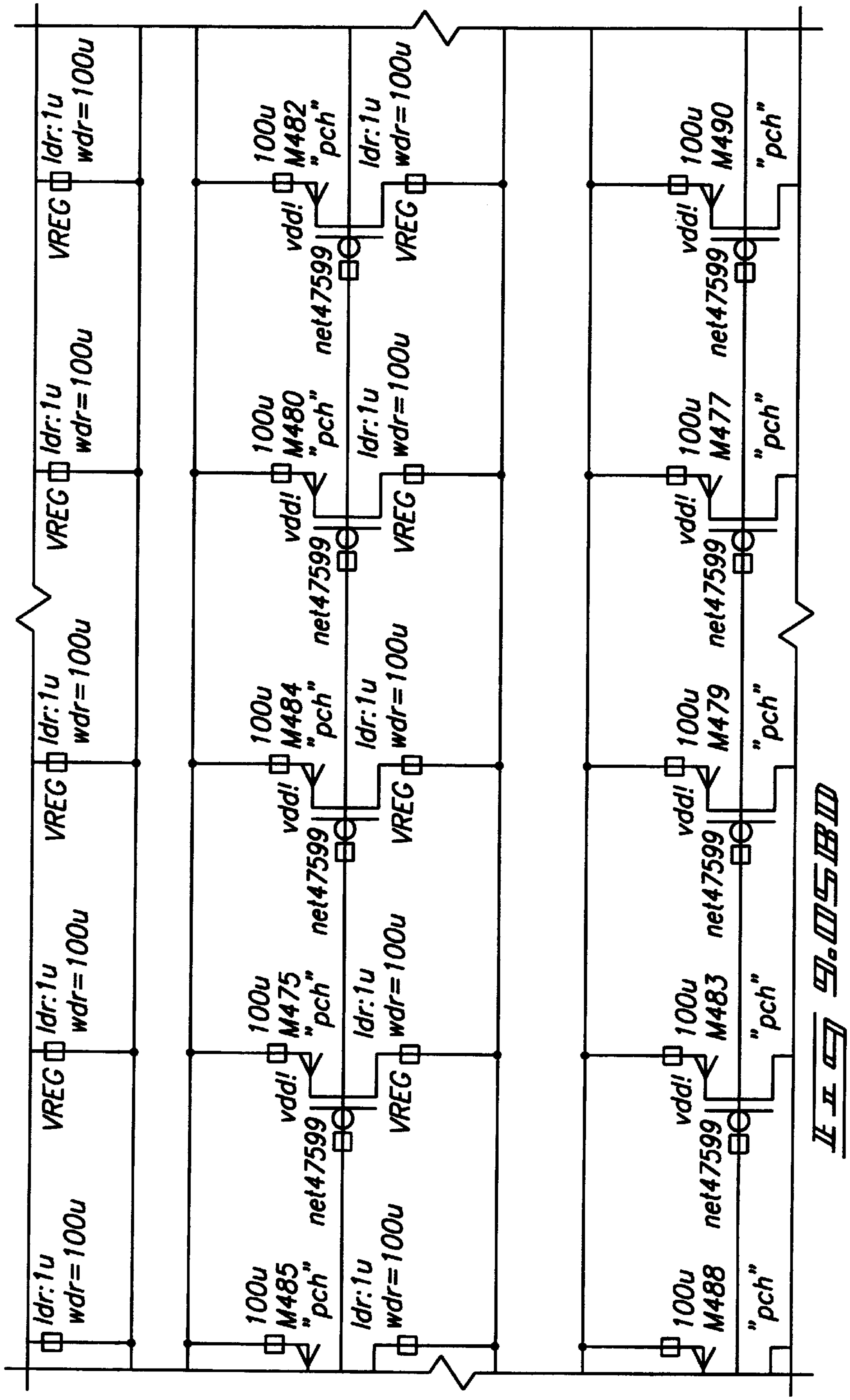
FIG. 9.05BD

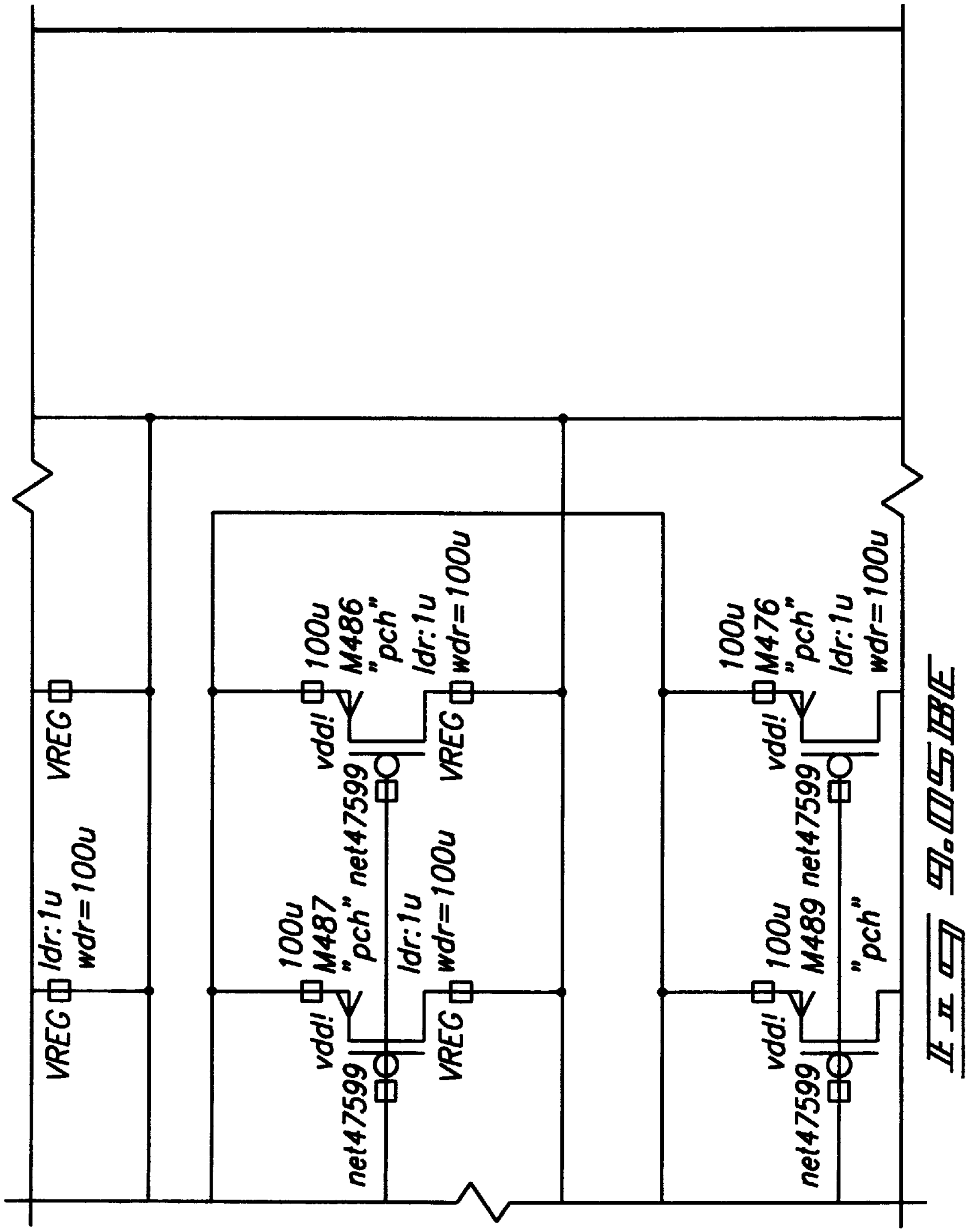
Fig. 9.05BE

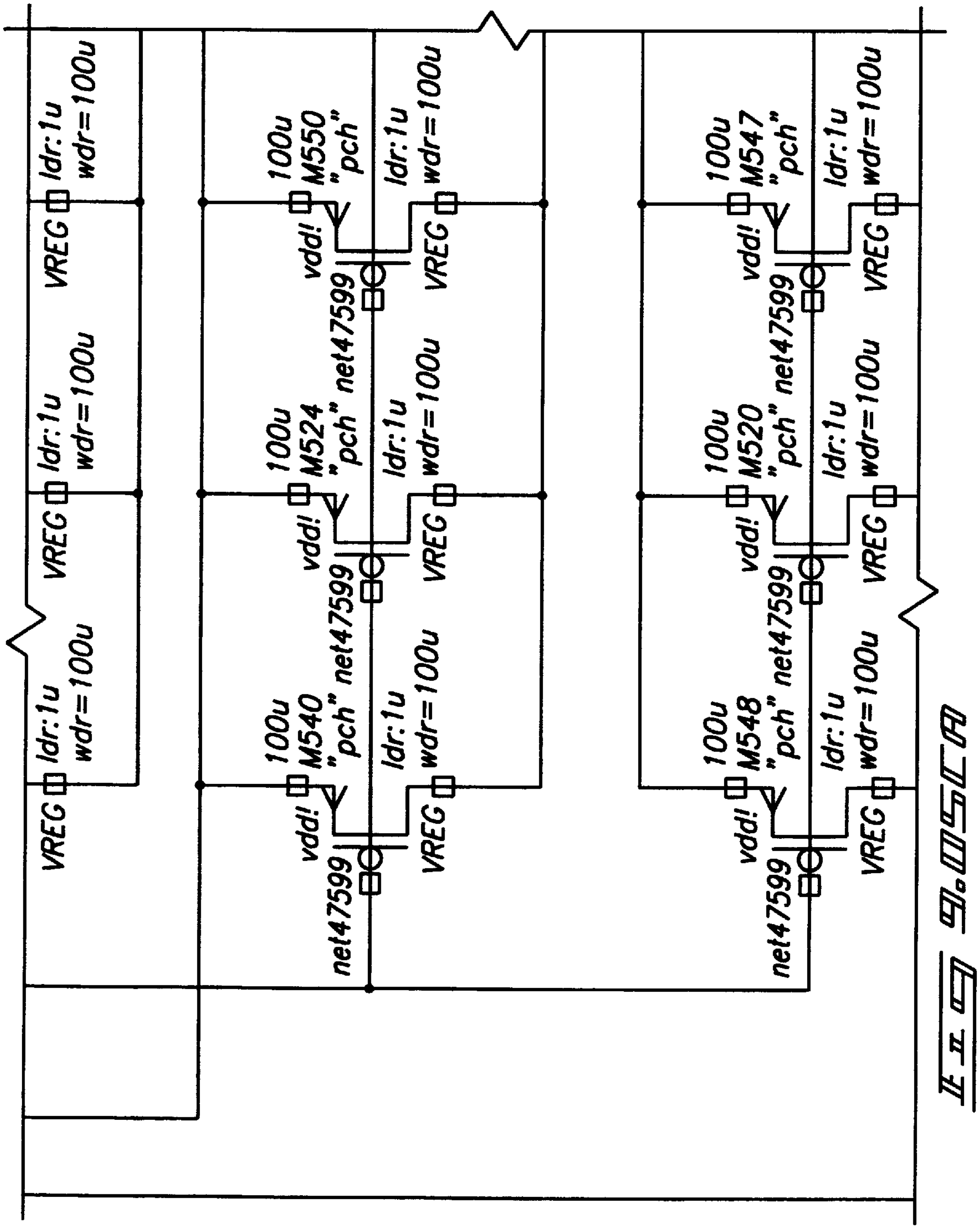
FIG 9.05CA

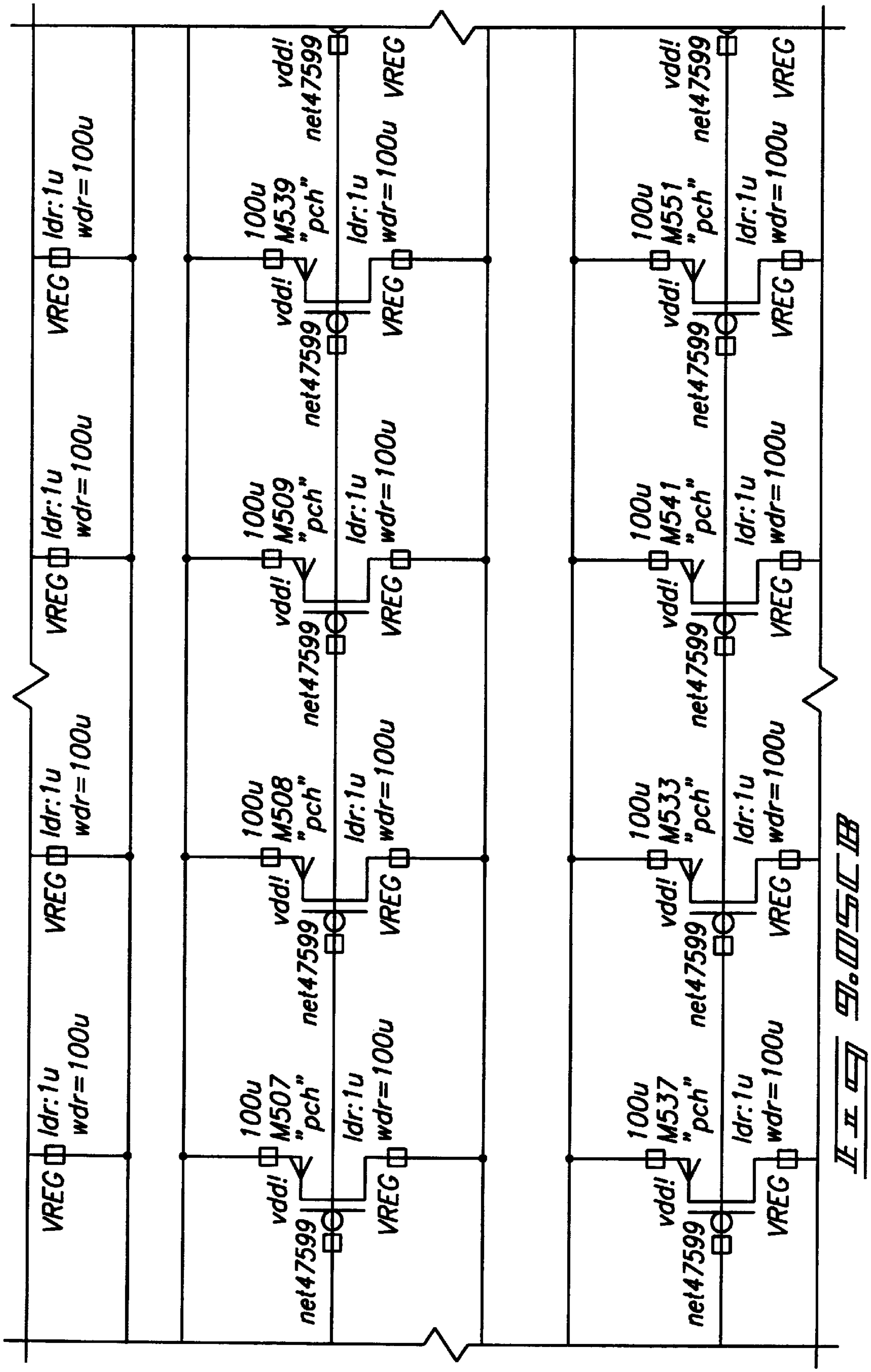
FIG. 9.05CB

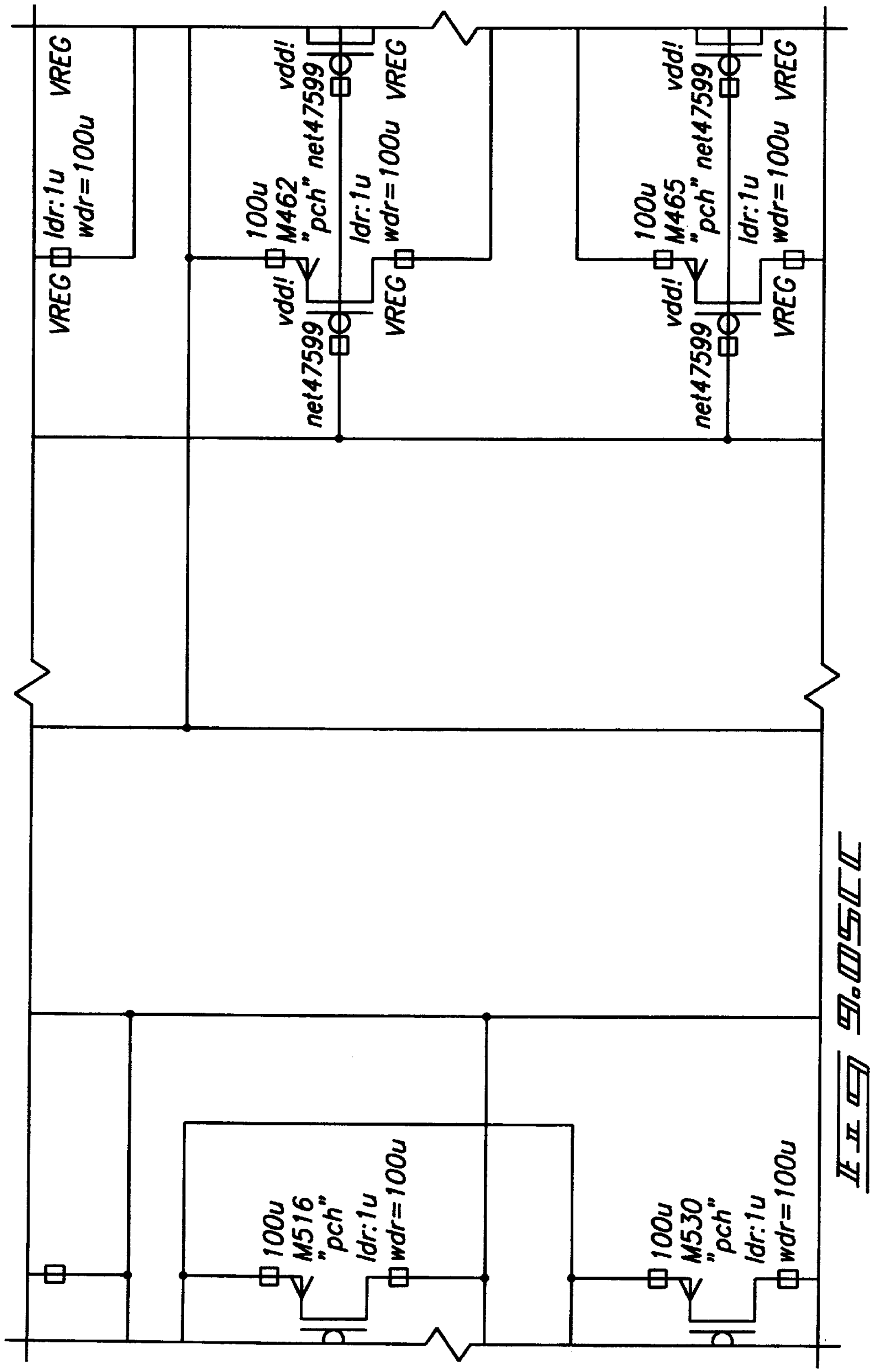
Fig. 9.05CC

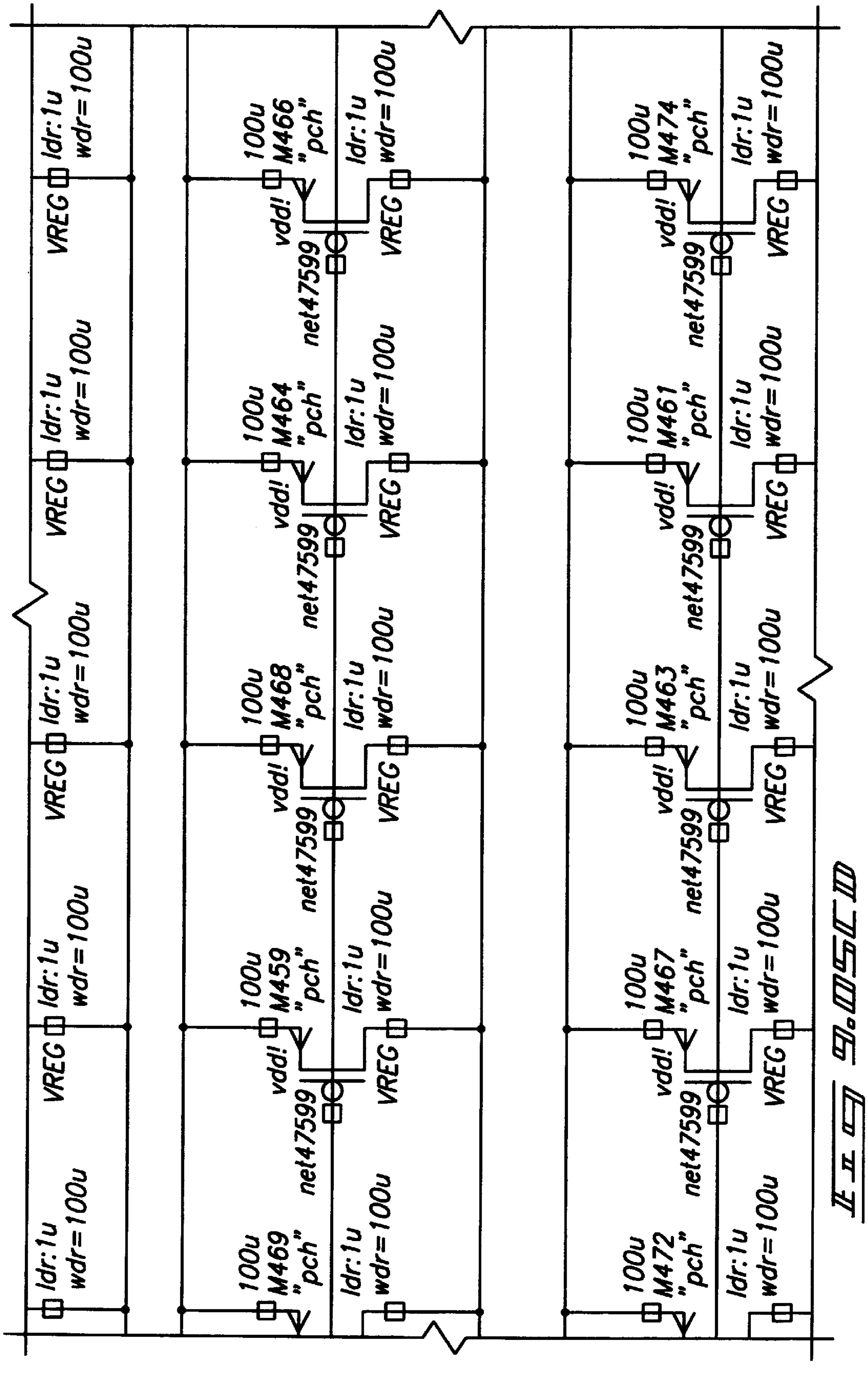
FIG. 9.05CD

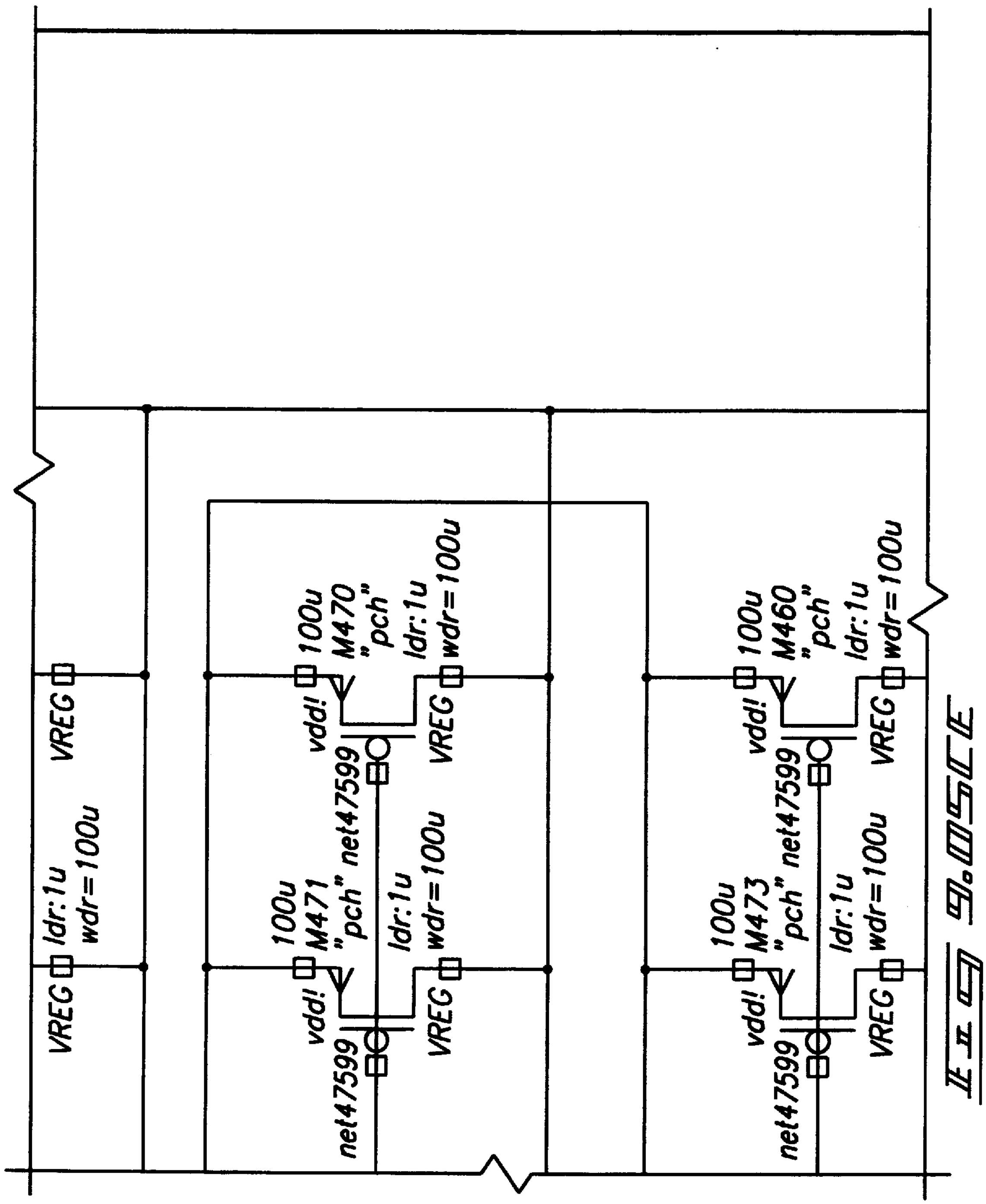
FIG. 9.005CE

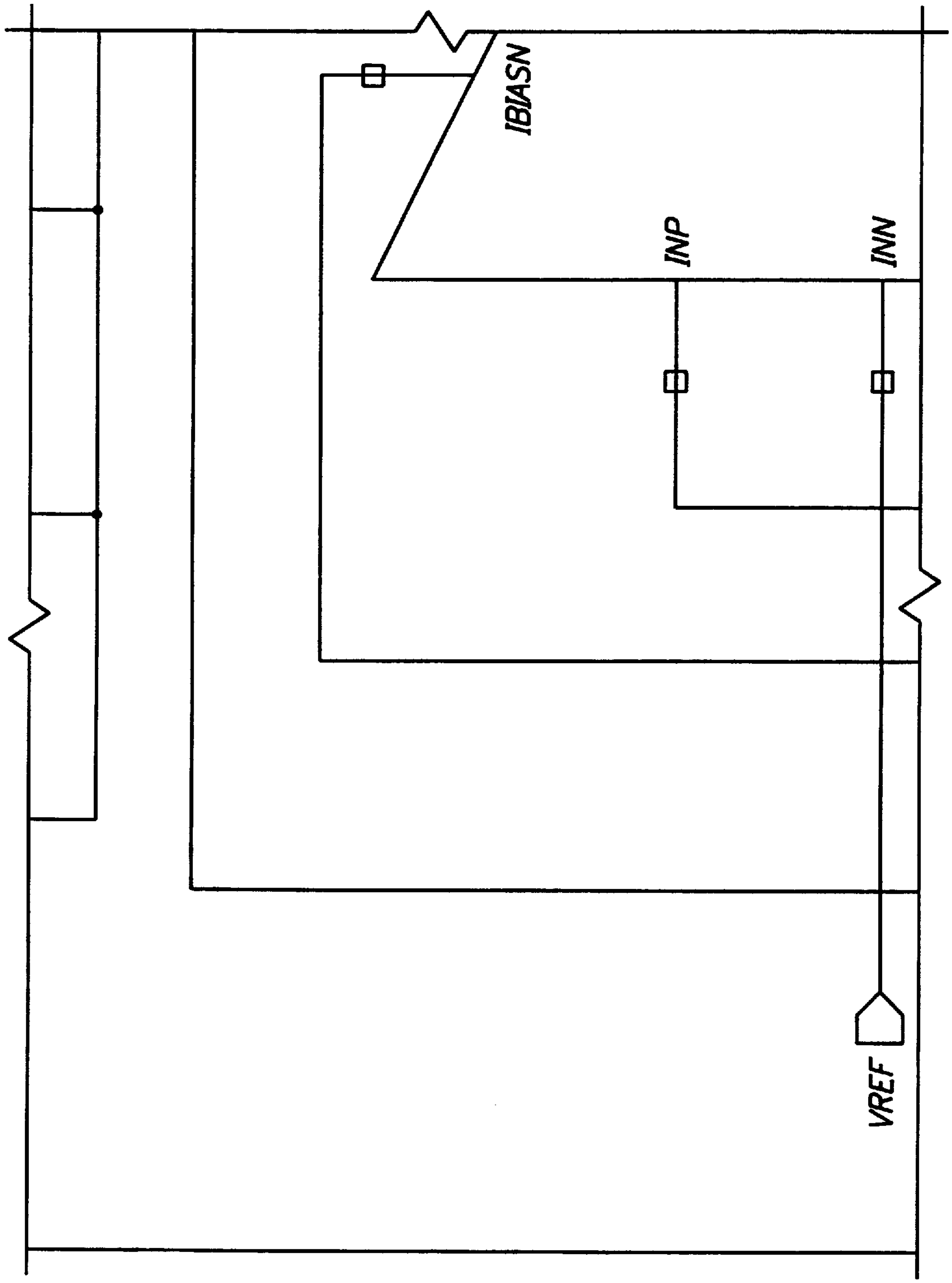
FIG 9.05DA

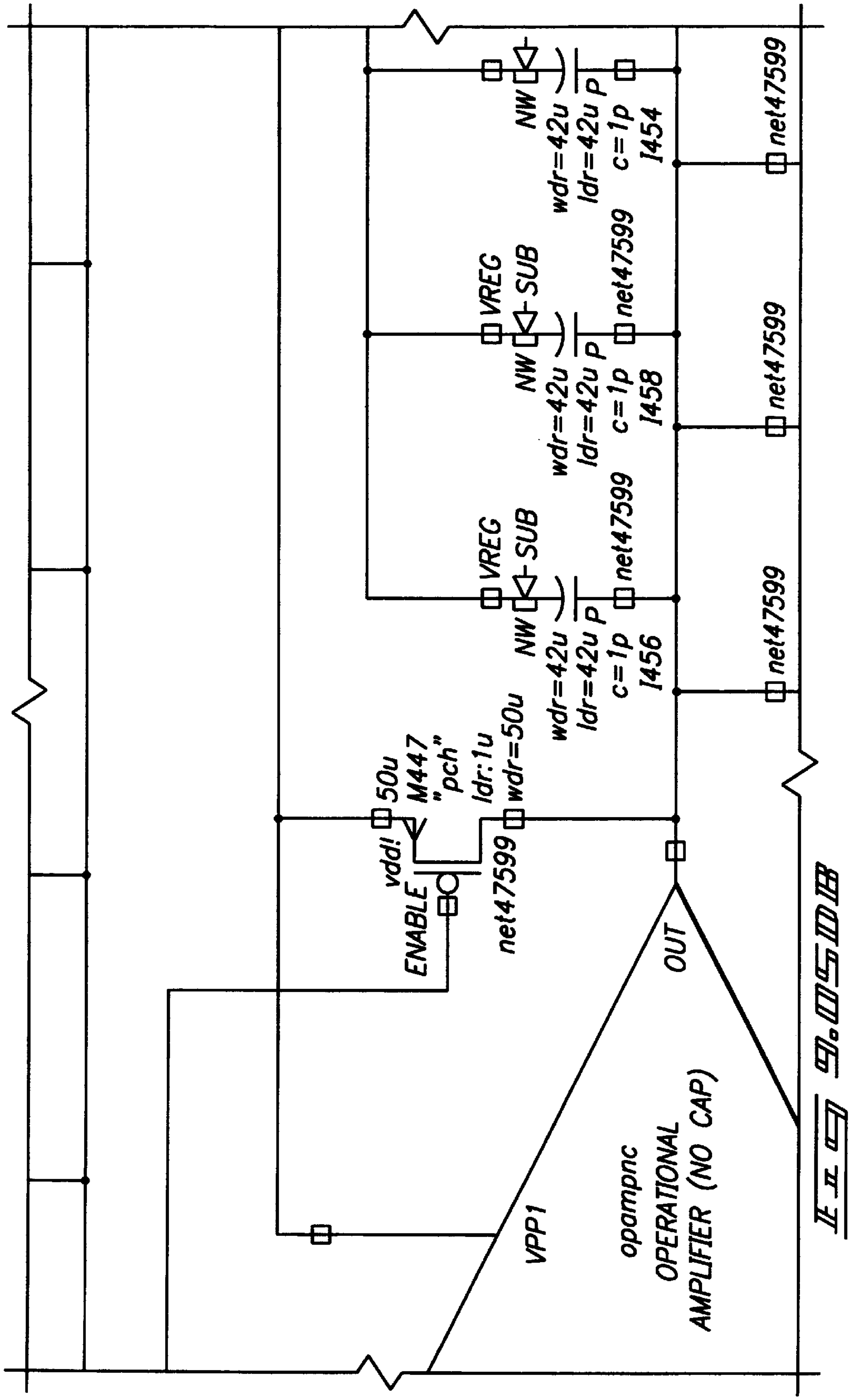
Fig. 9.05DB

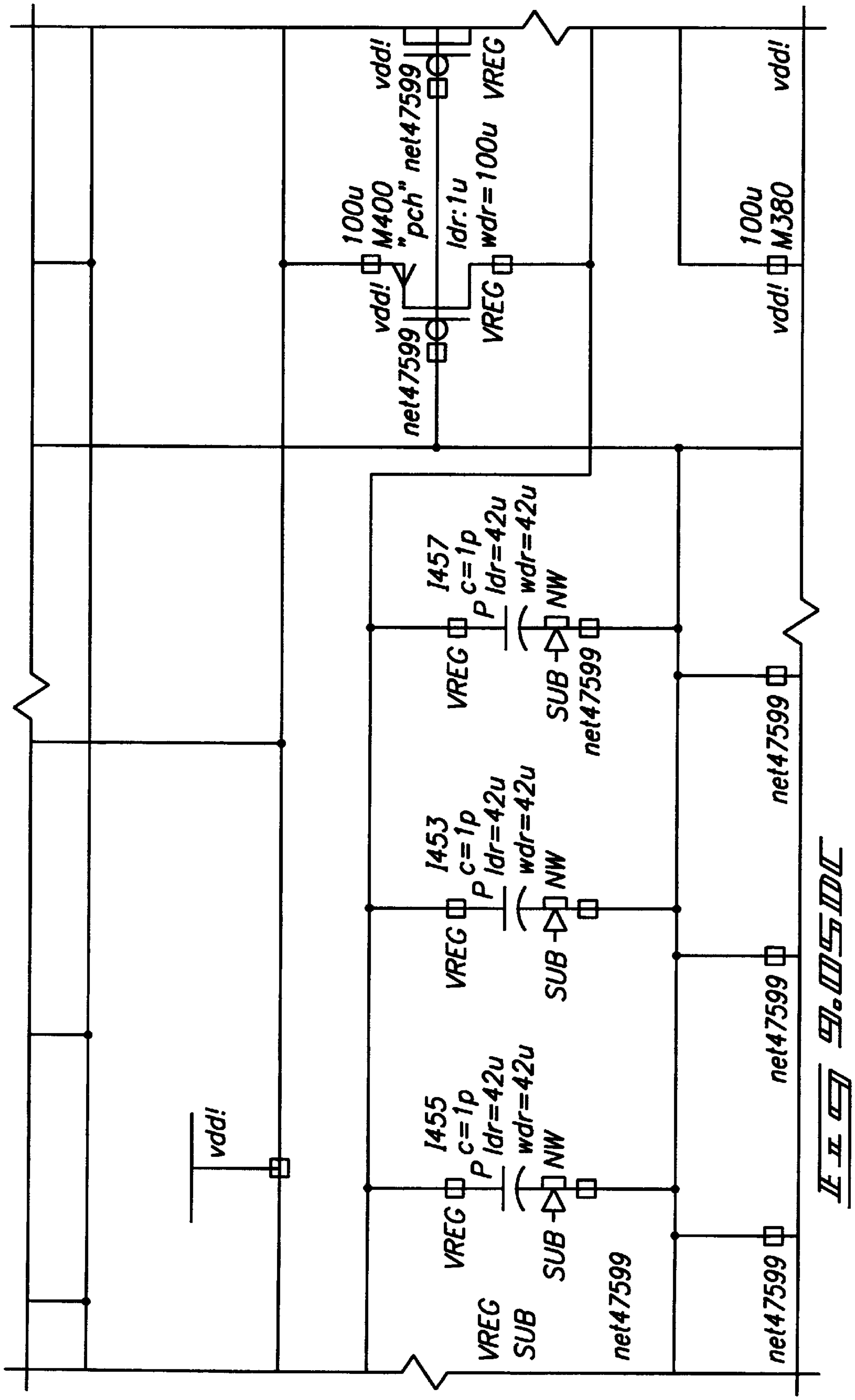
Fig. 9.05DC

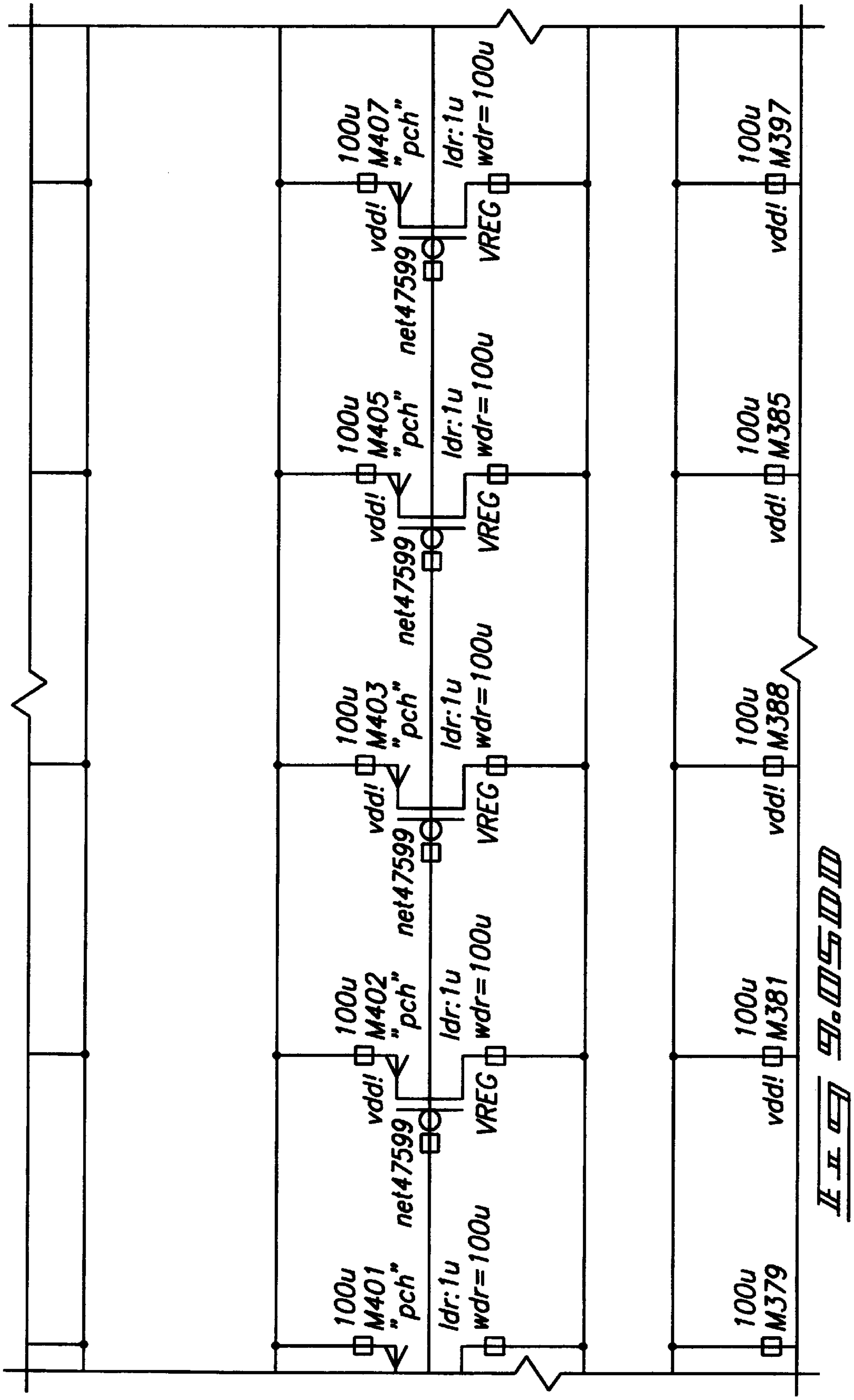
FIG. 9.05DD

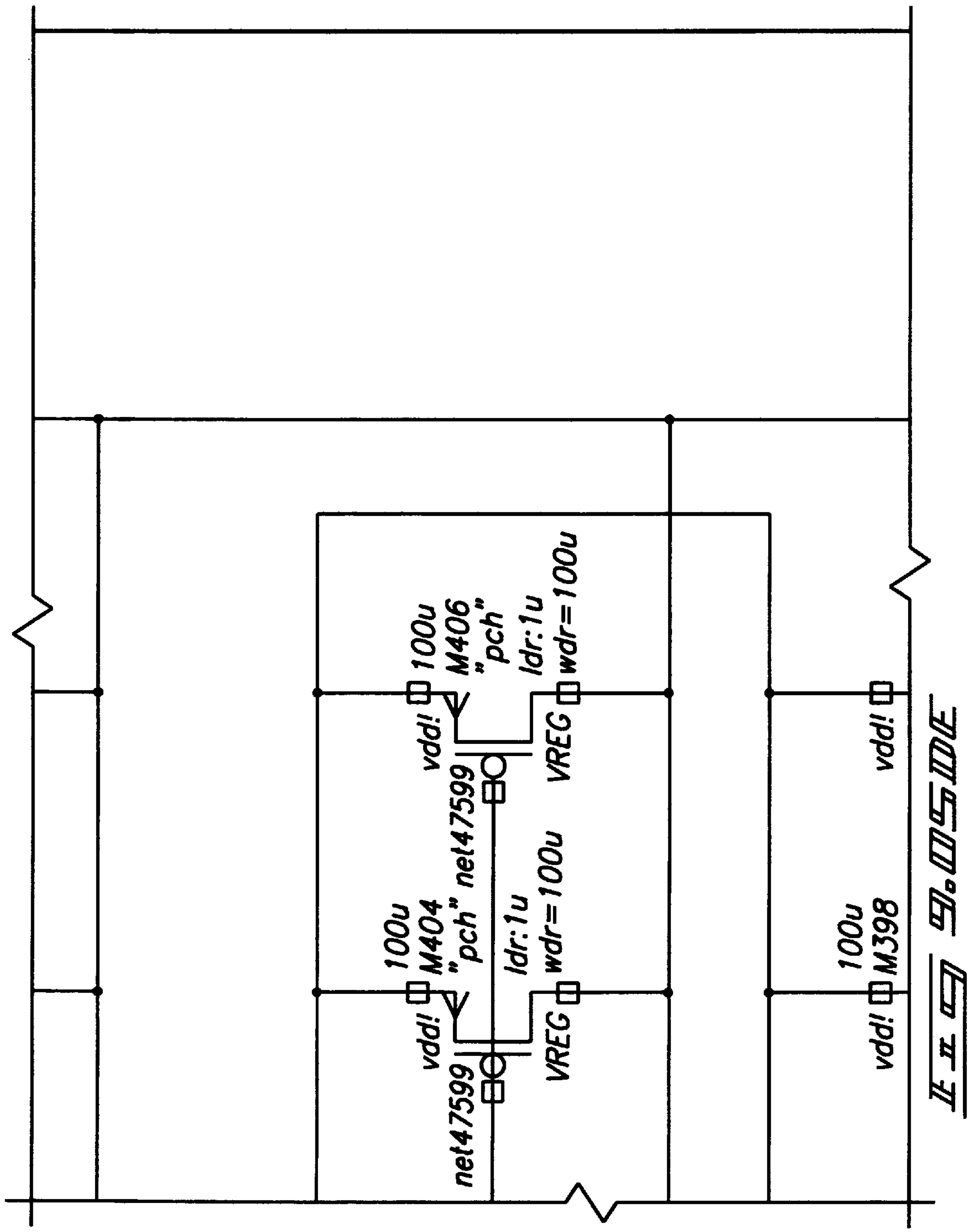
Fig. 9.05DE

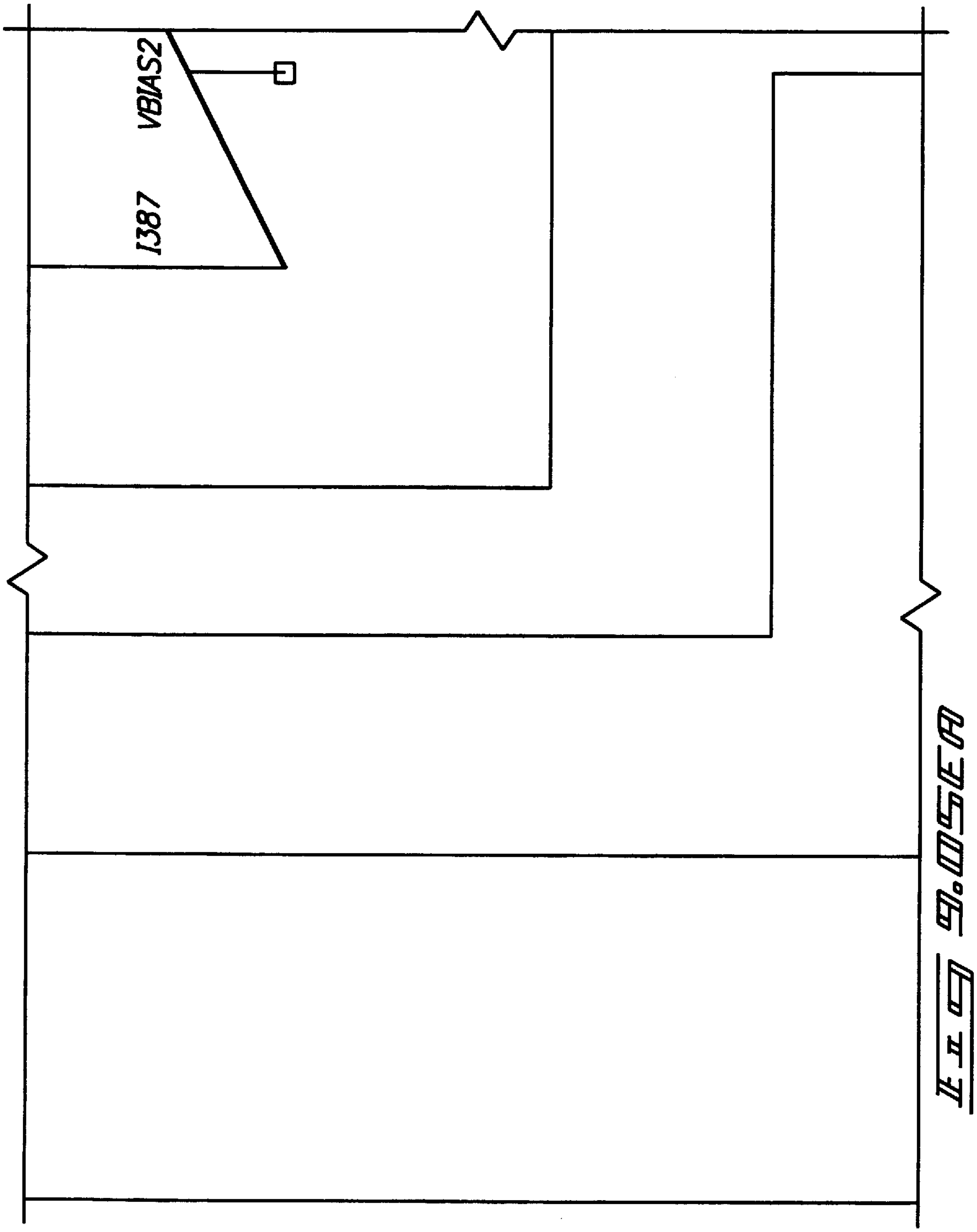
FIG. 9.05EA

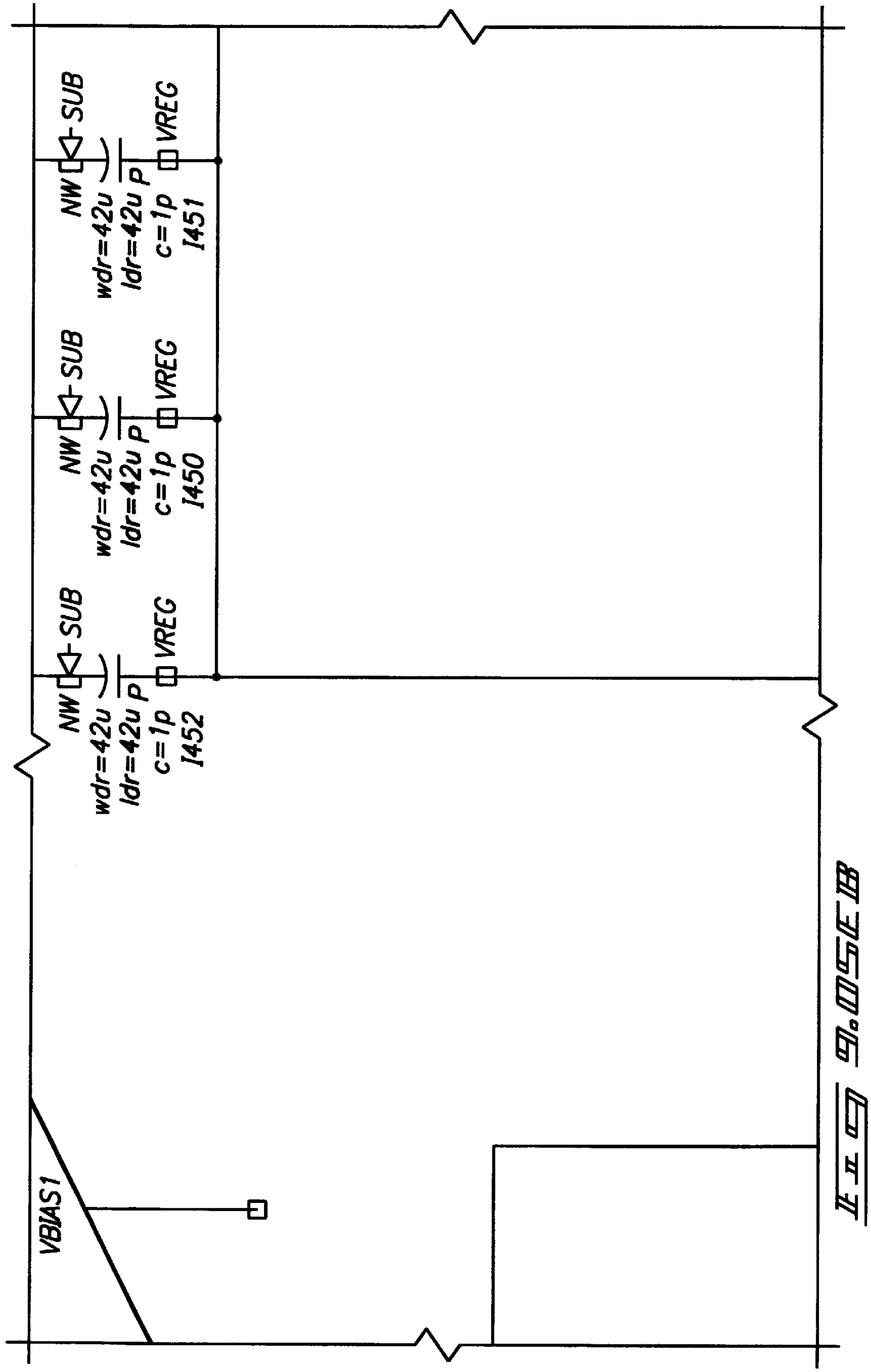
FIG. 9.05EB

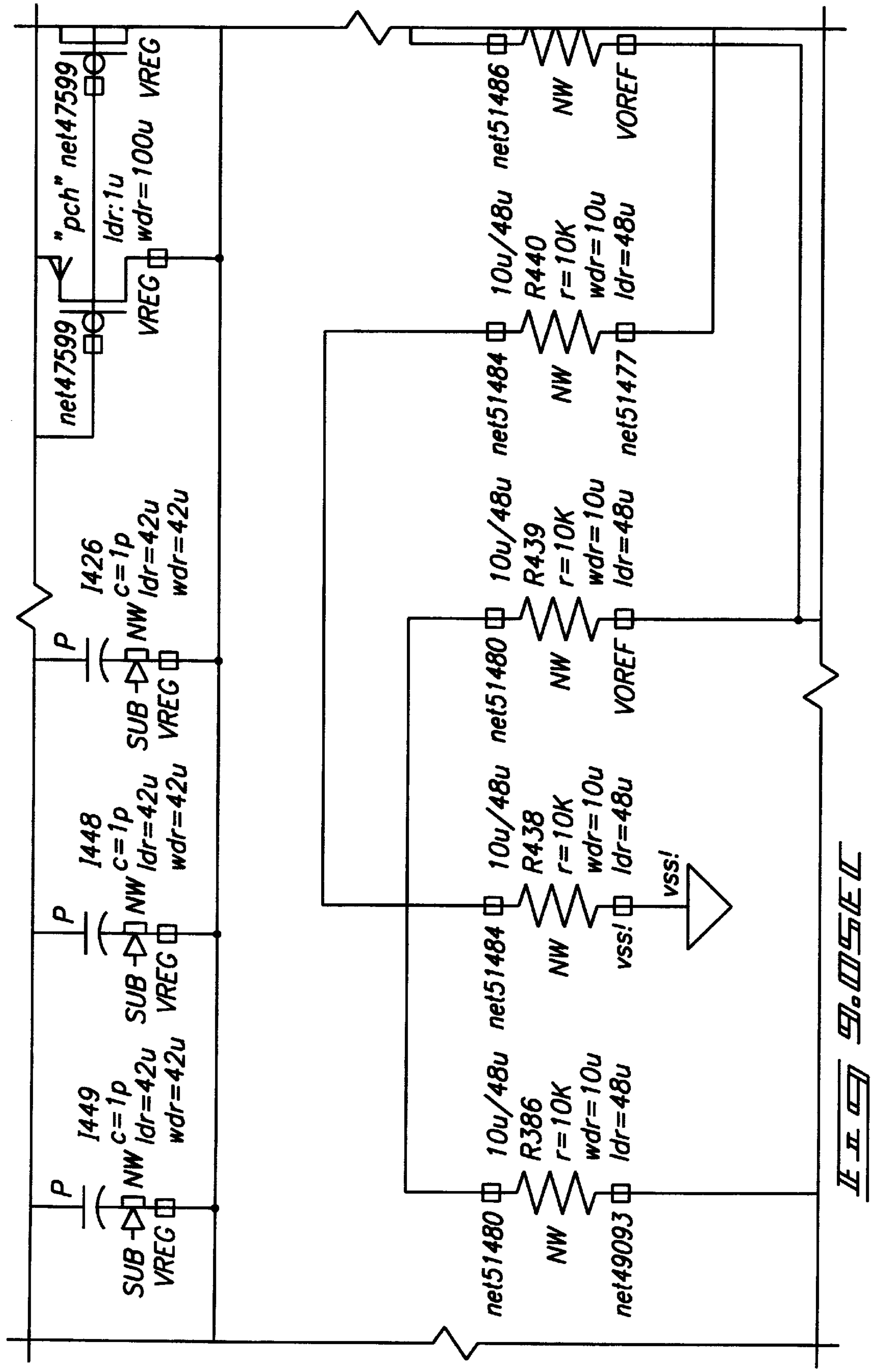
FIG. 9.05EE

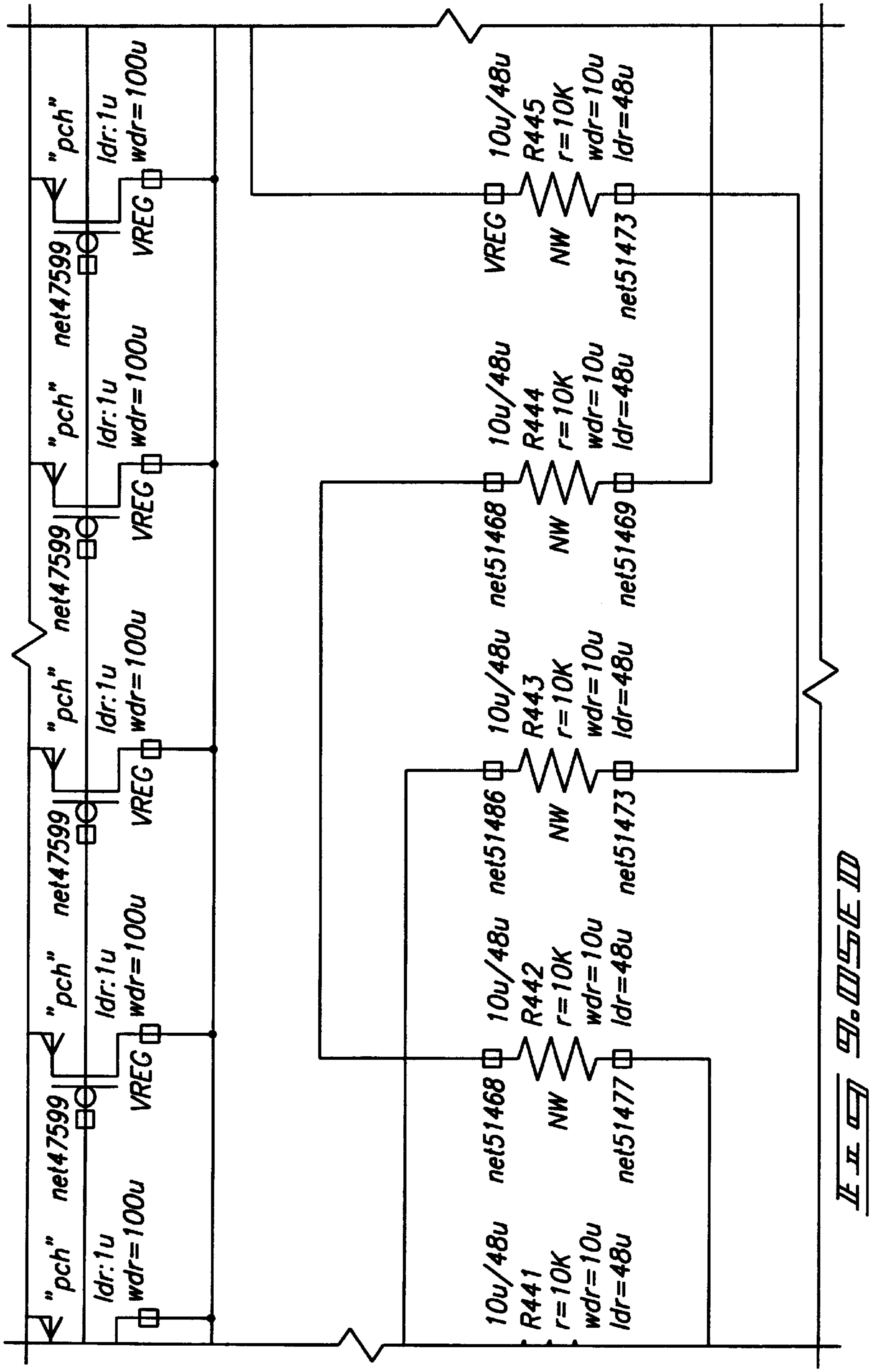
FIG. 9.005ED

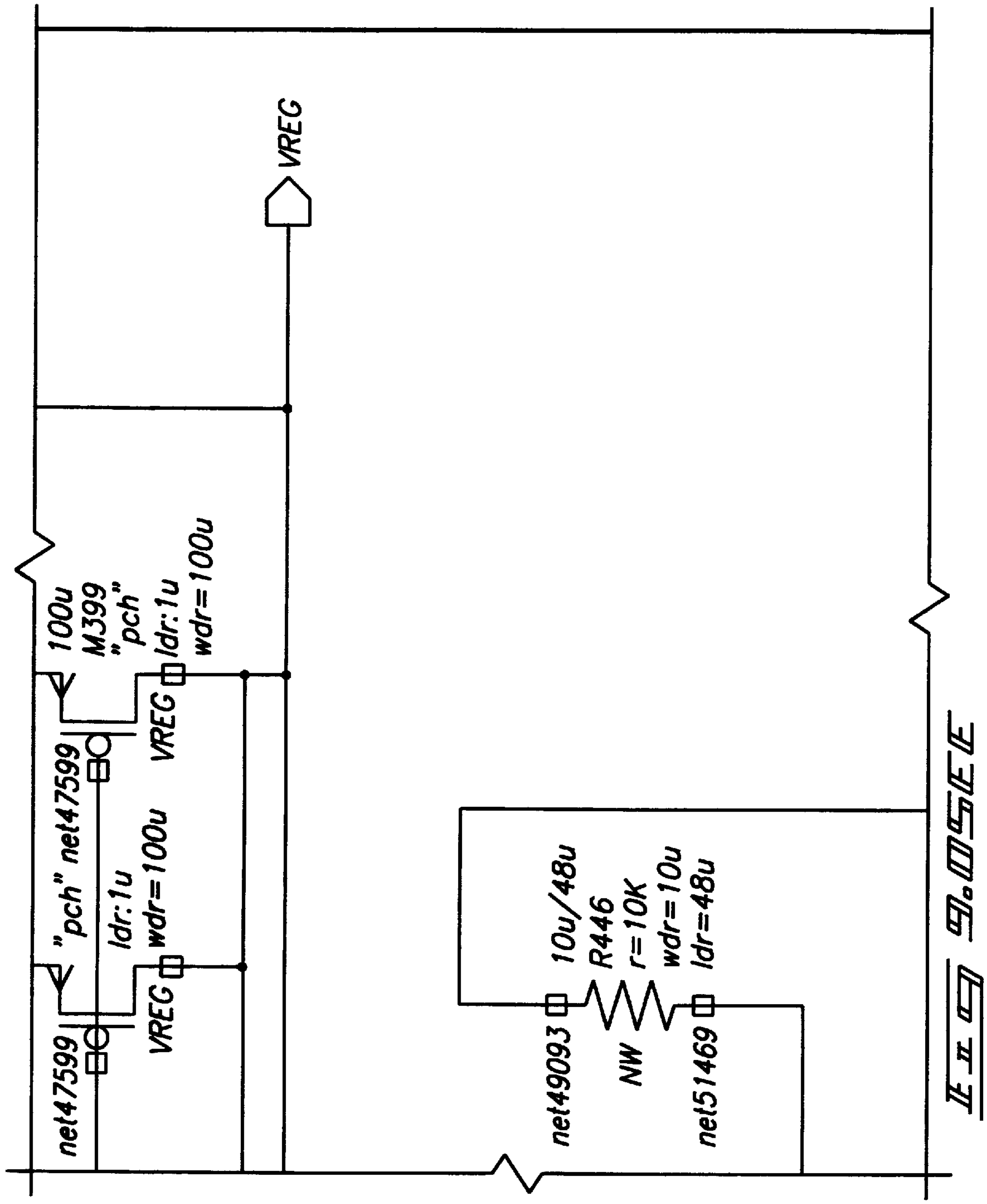
FIG. 9.05EE

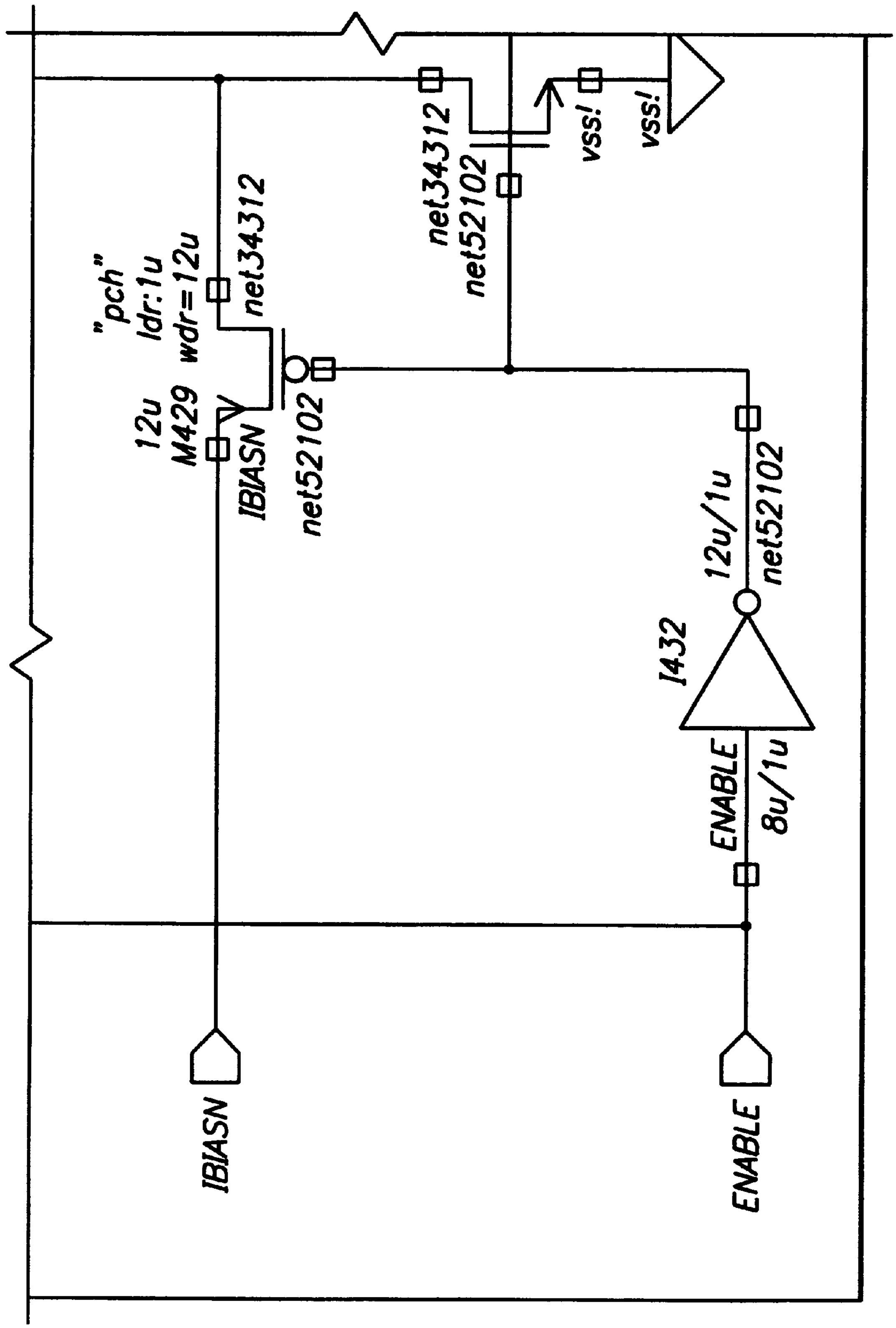
FIG 9.05FA

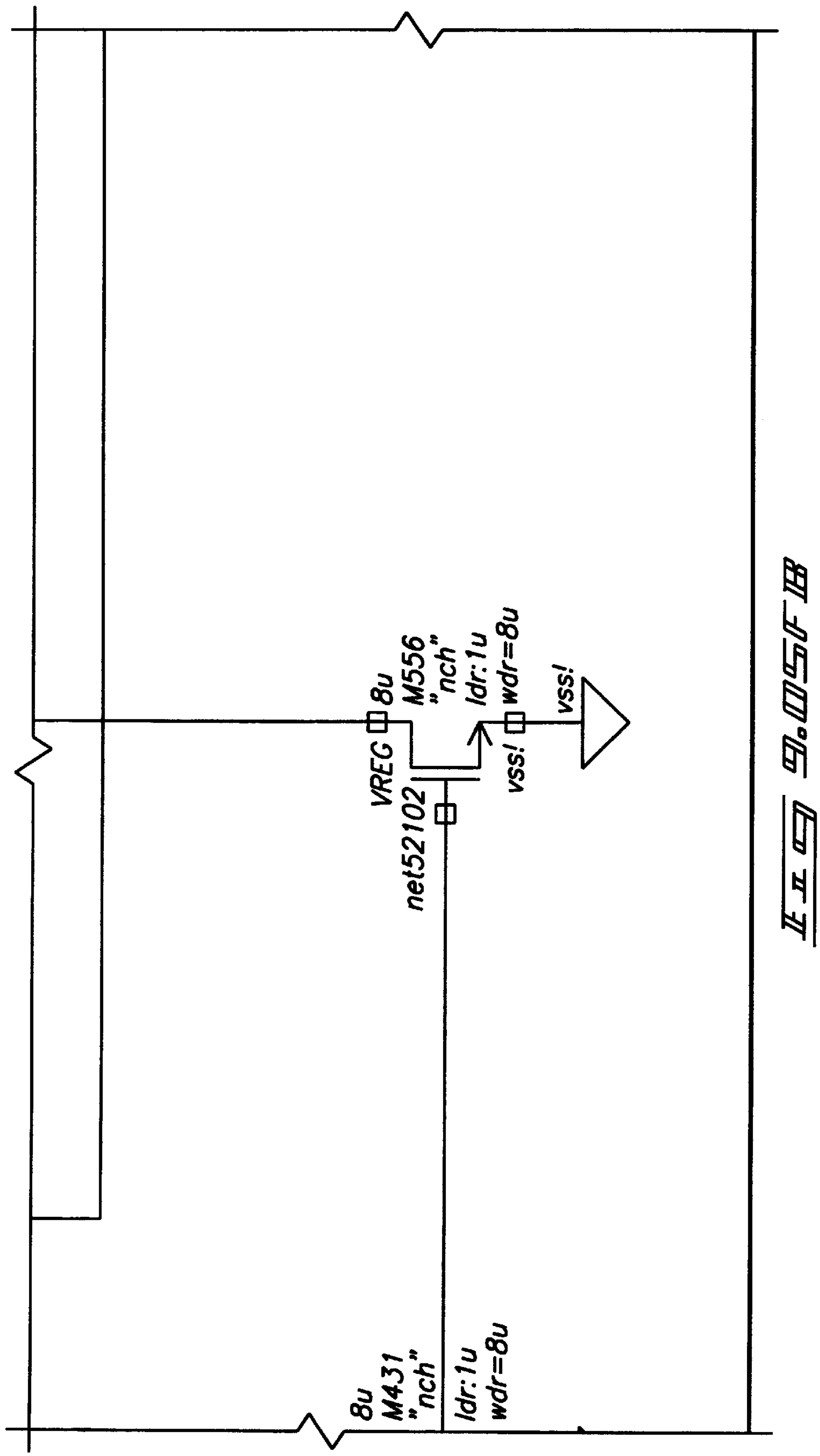
Fig. 9.05FB

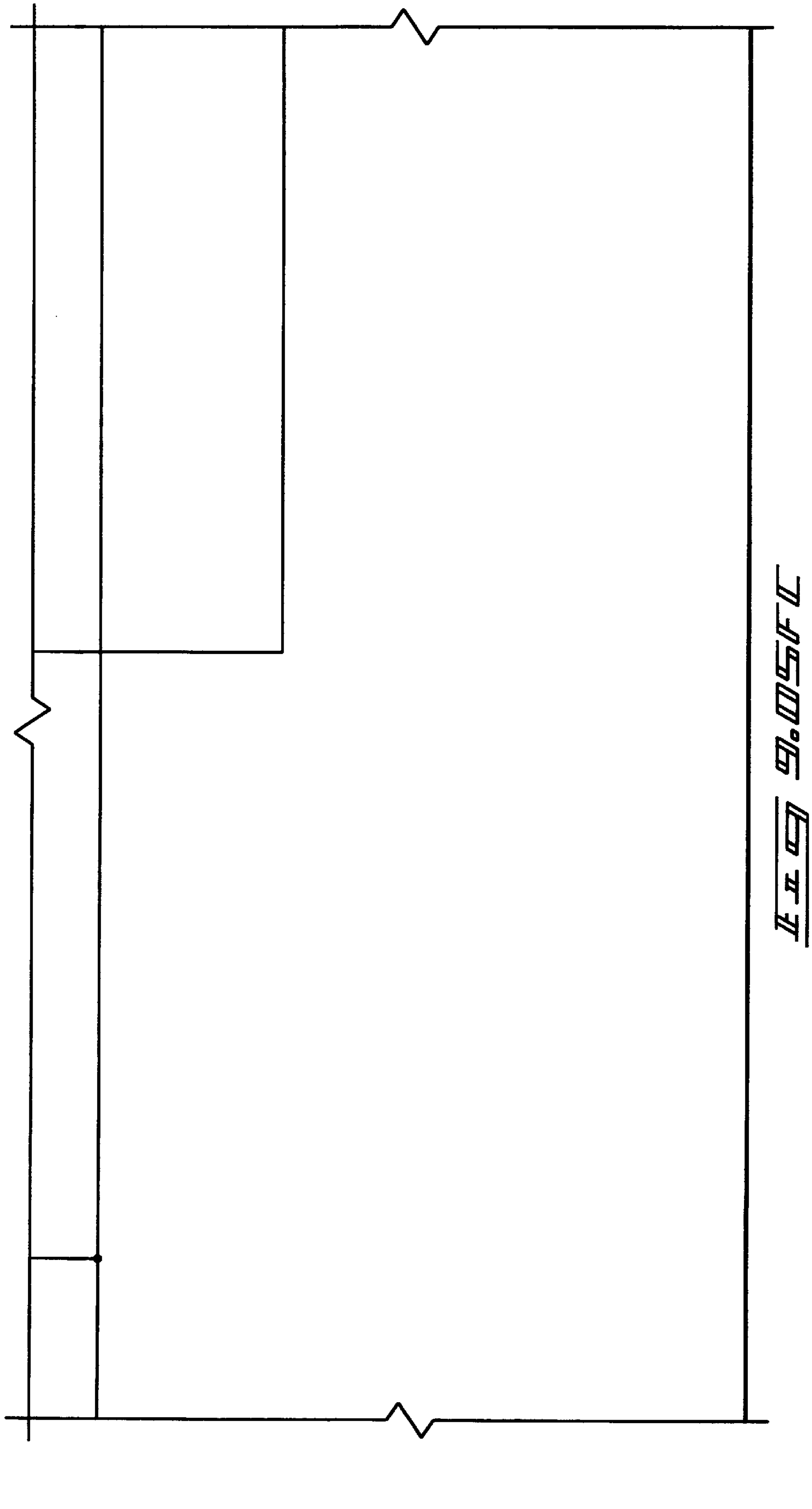
FIG. 9.05FC

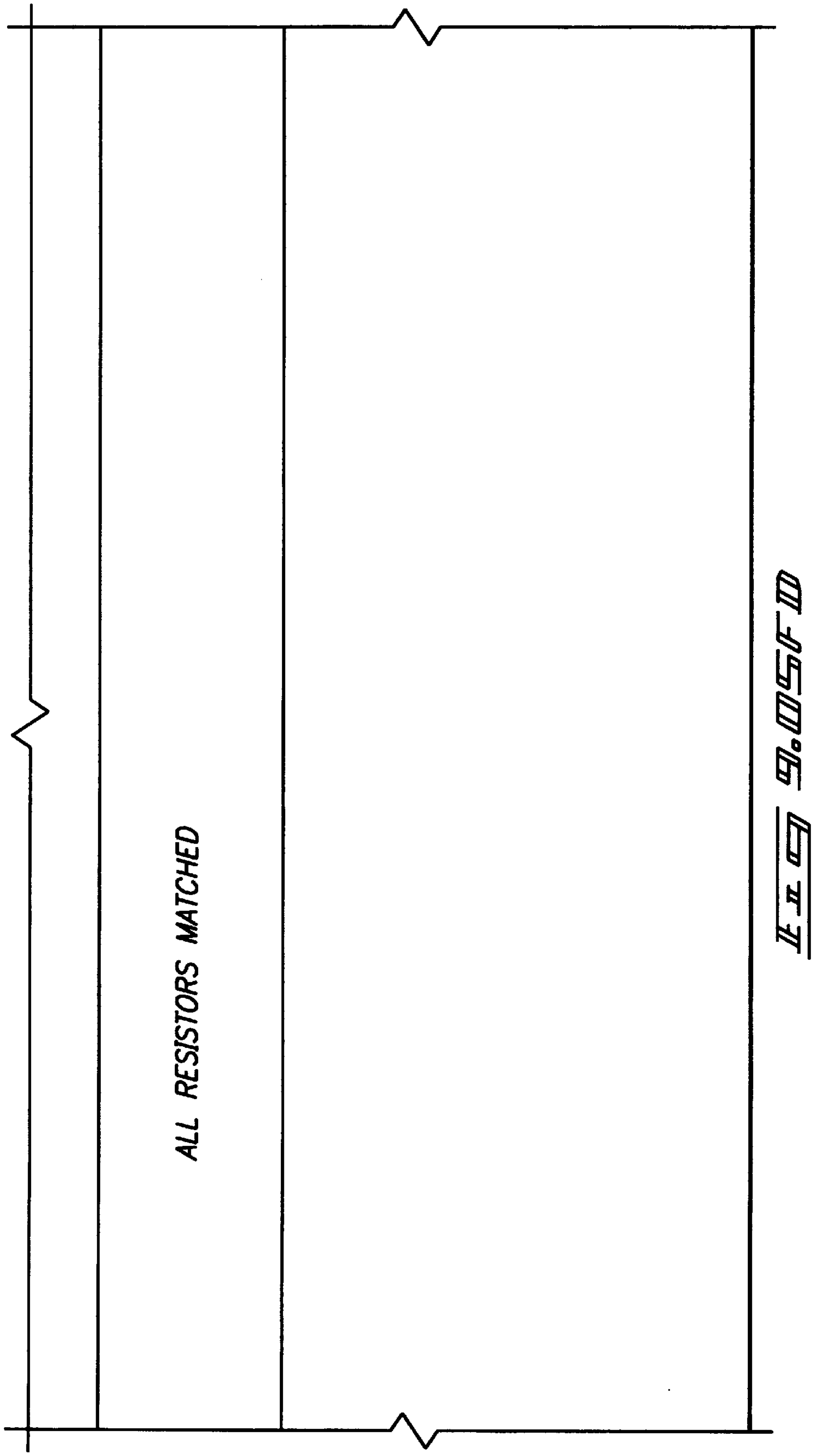
FIG. 9.05FD

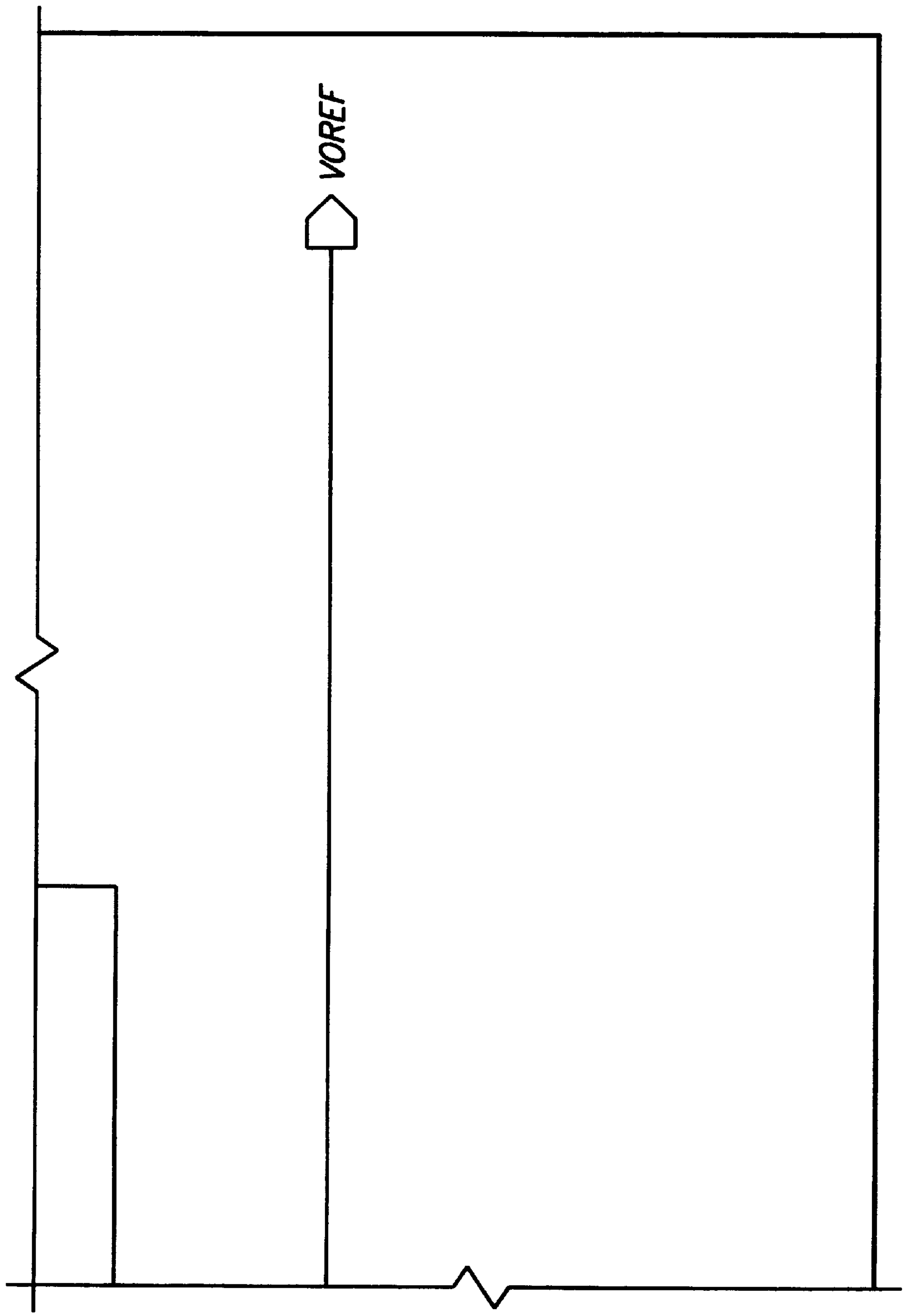
FIG. 9.05FE

| | | | |
|---|---|---|---|
| 9.0501AA | 9.0501AB | 9.0501AC | 9.0501AD |
| 9.0501BA | 9.0501BB | 9.0501BC | 9.0501BD |
| 9.0501CA | 9.0501CB | 9.0501CC | 9.0501CD |

FIG 9.0501

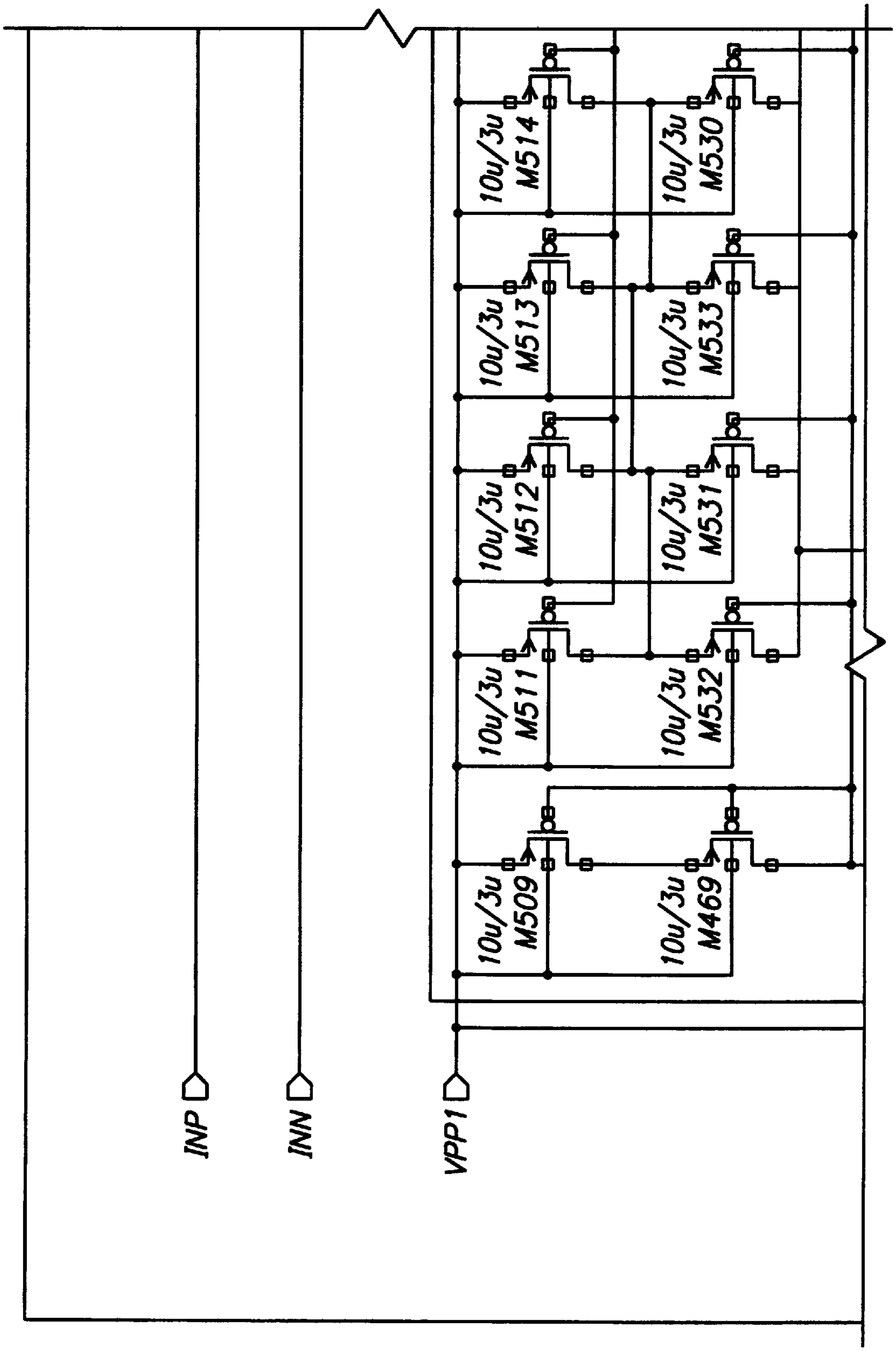
FIG. 9.0501AA

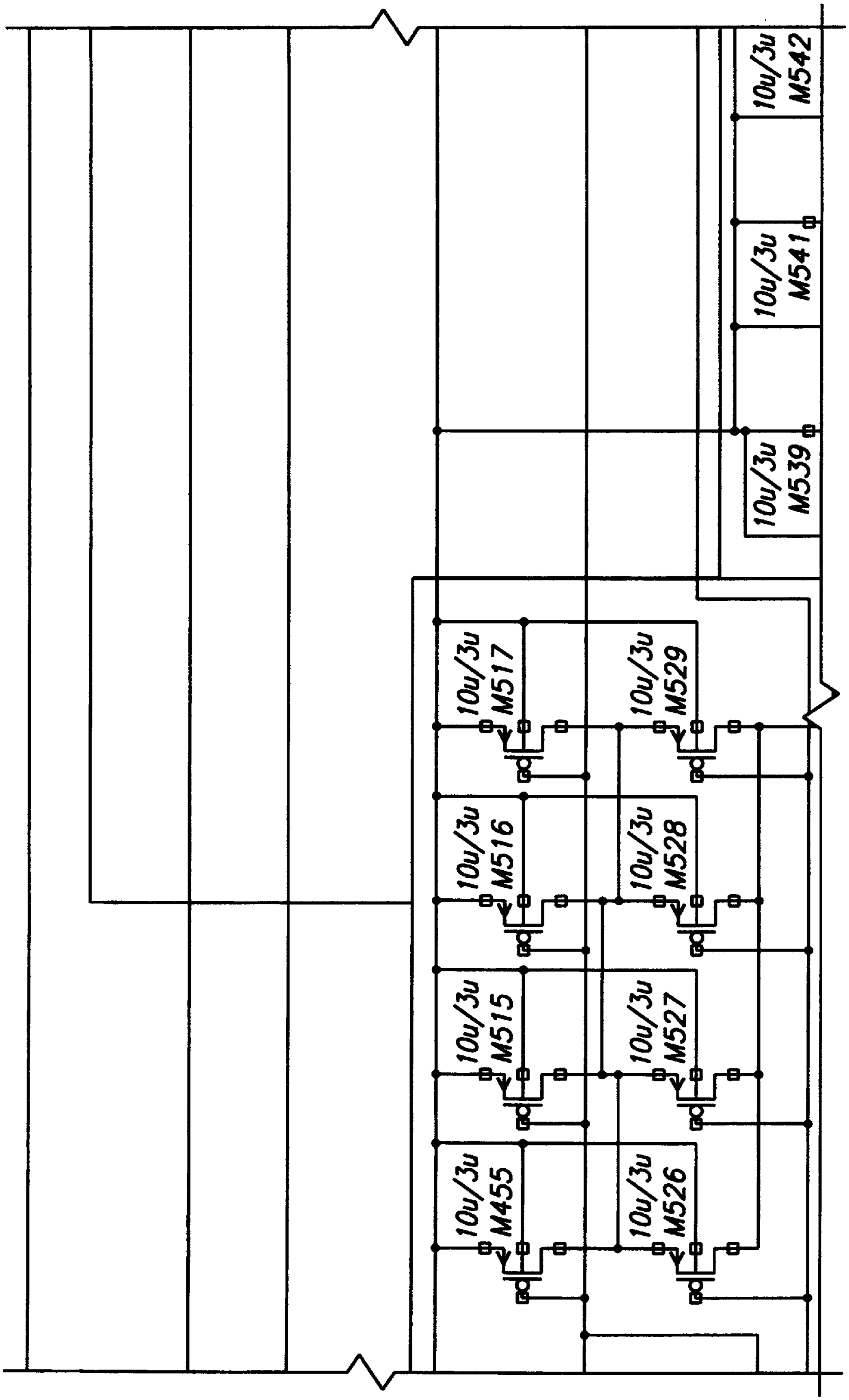
FIG. 9.050IAB

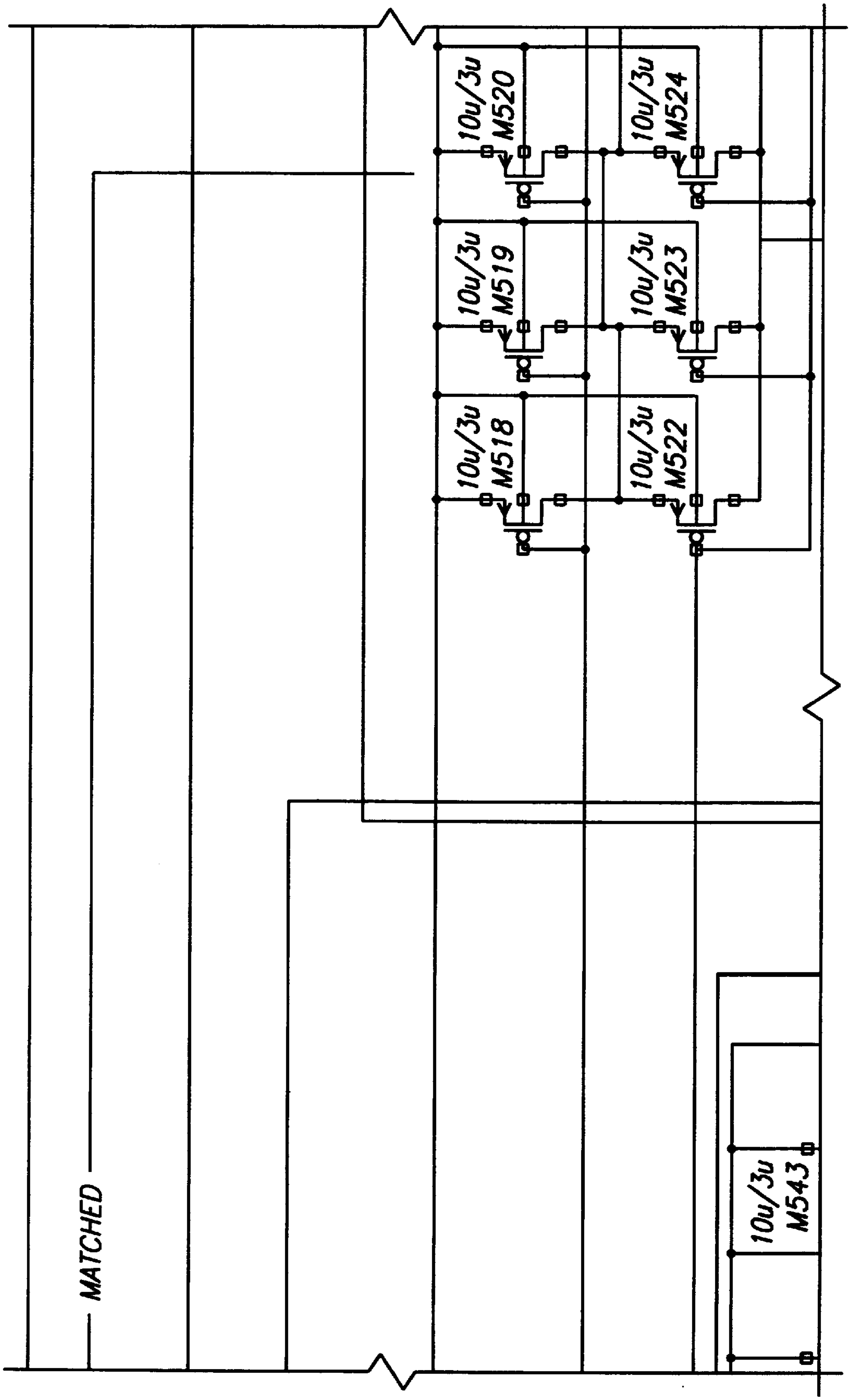
FIG. 9.050IAC

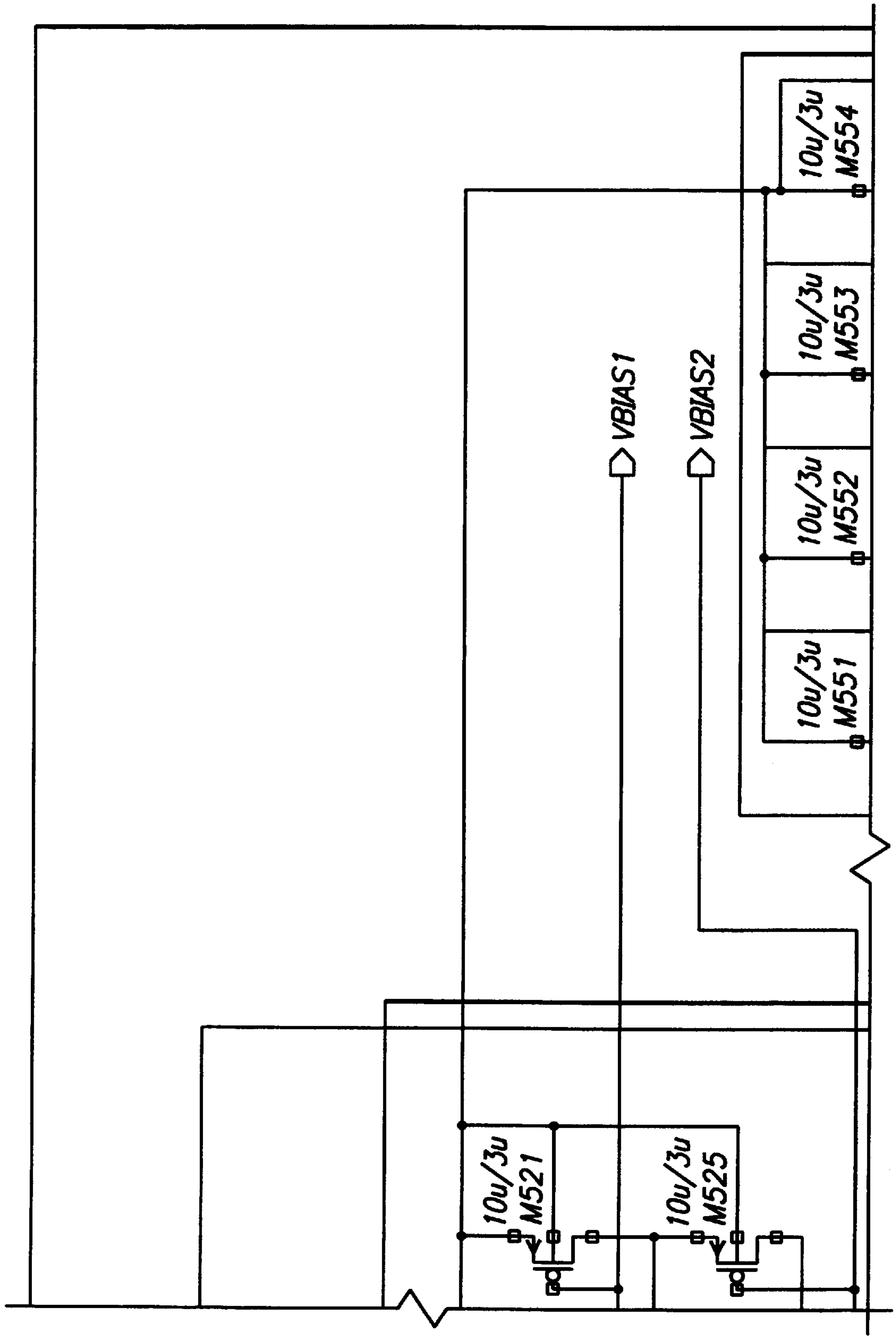
Fig 9.050IIAD

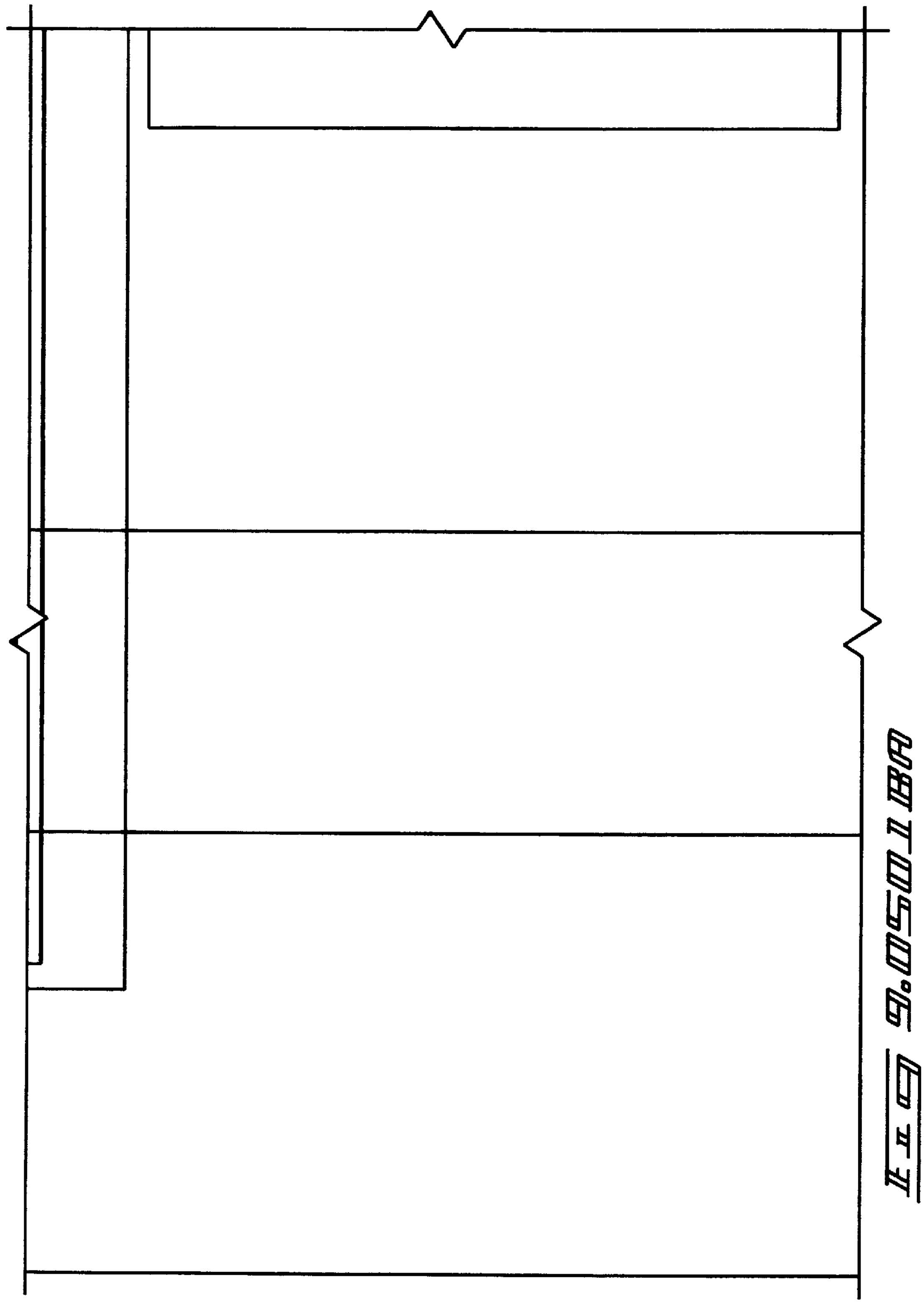
FIG. 9.05018A

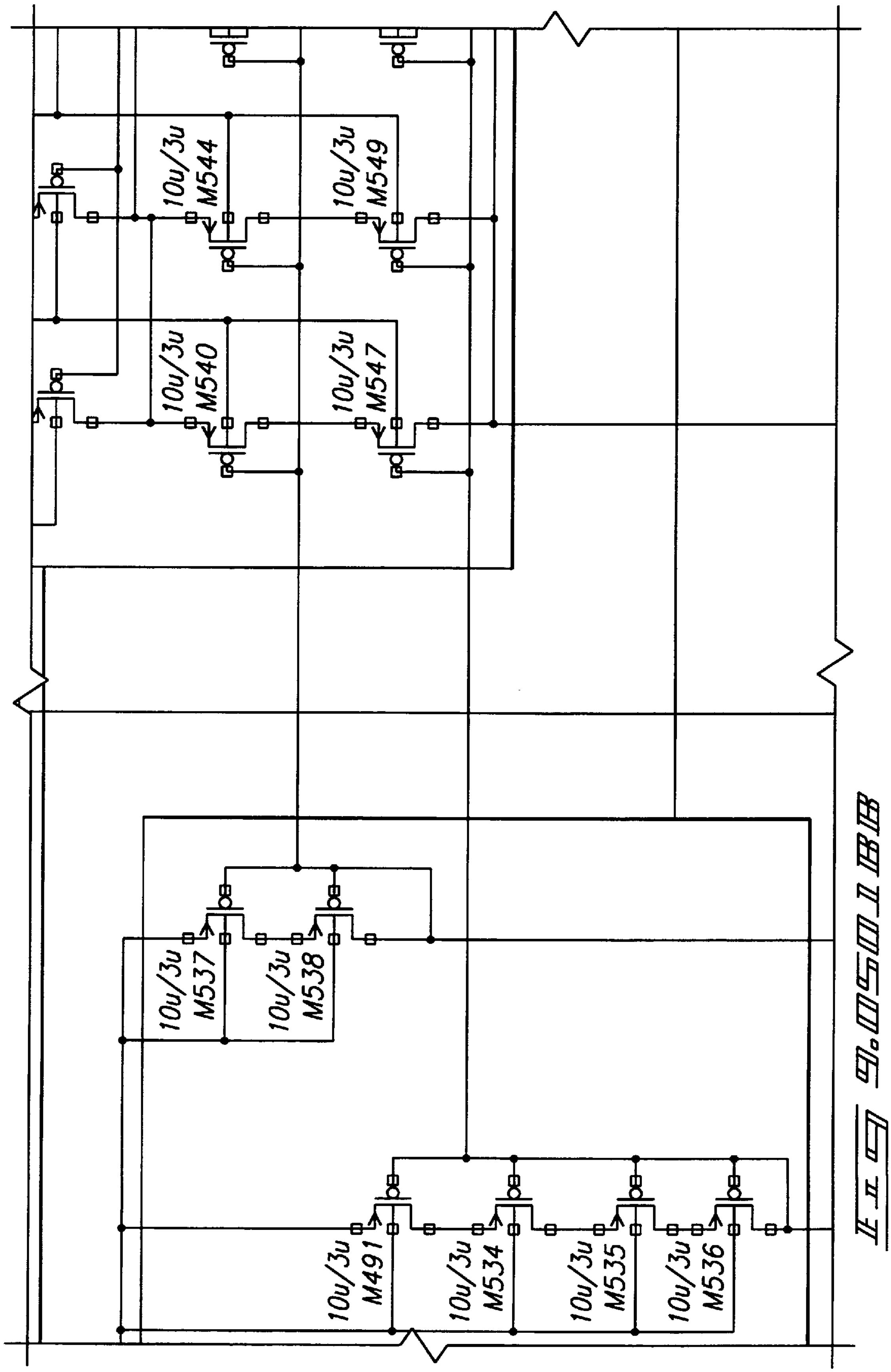
FIG. 9.050.1BB

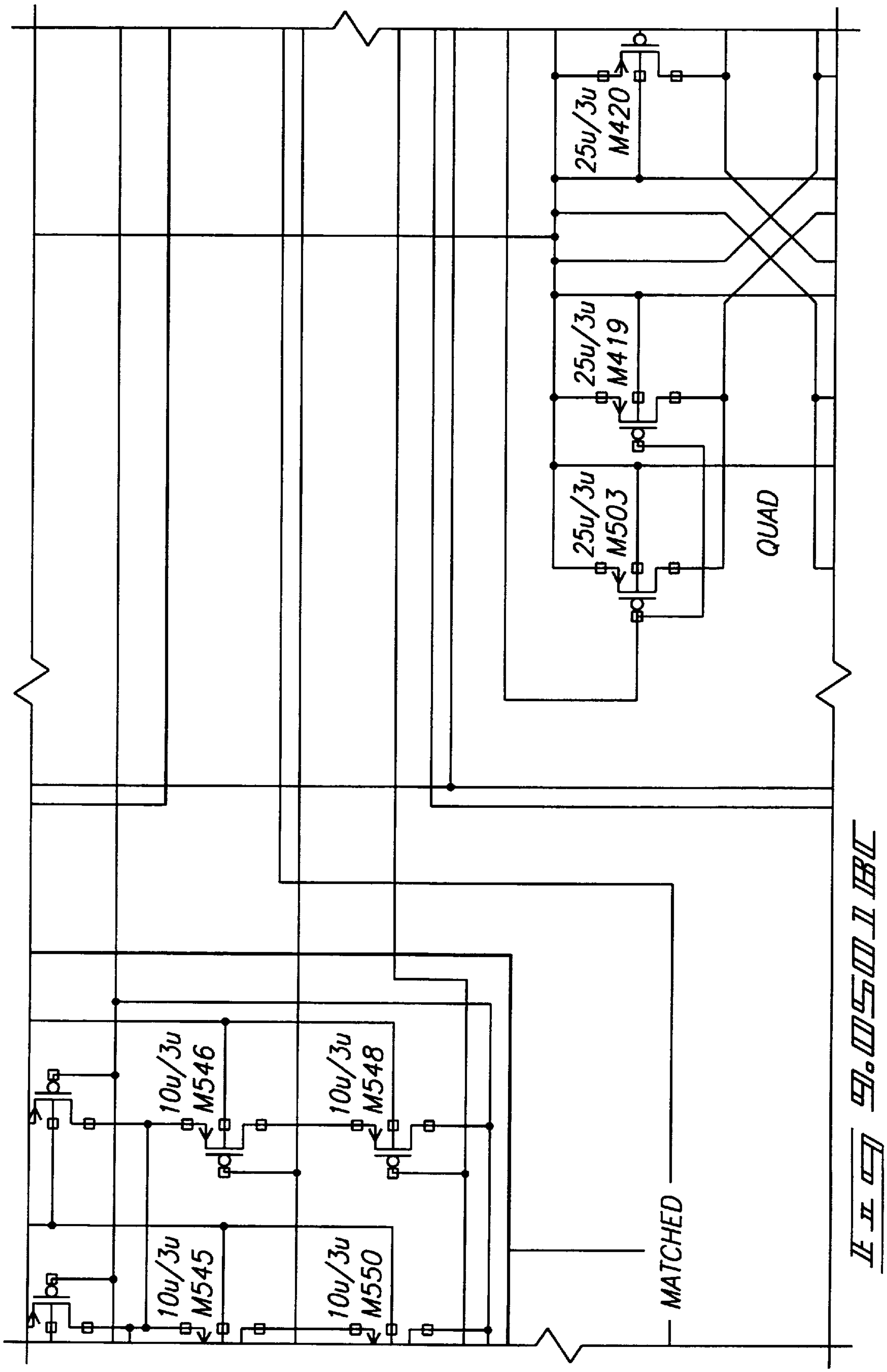
FIG. 9.05011BC

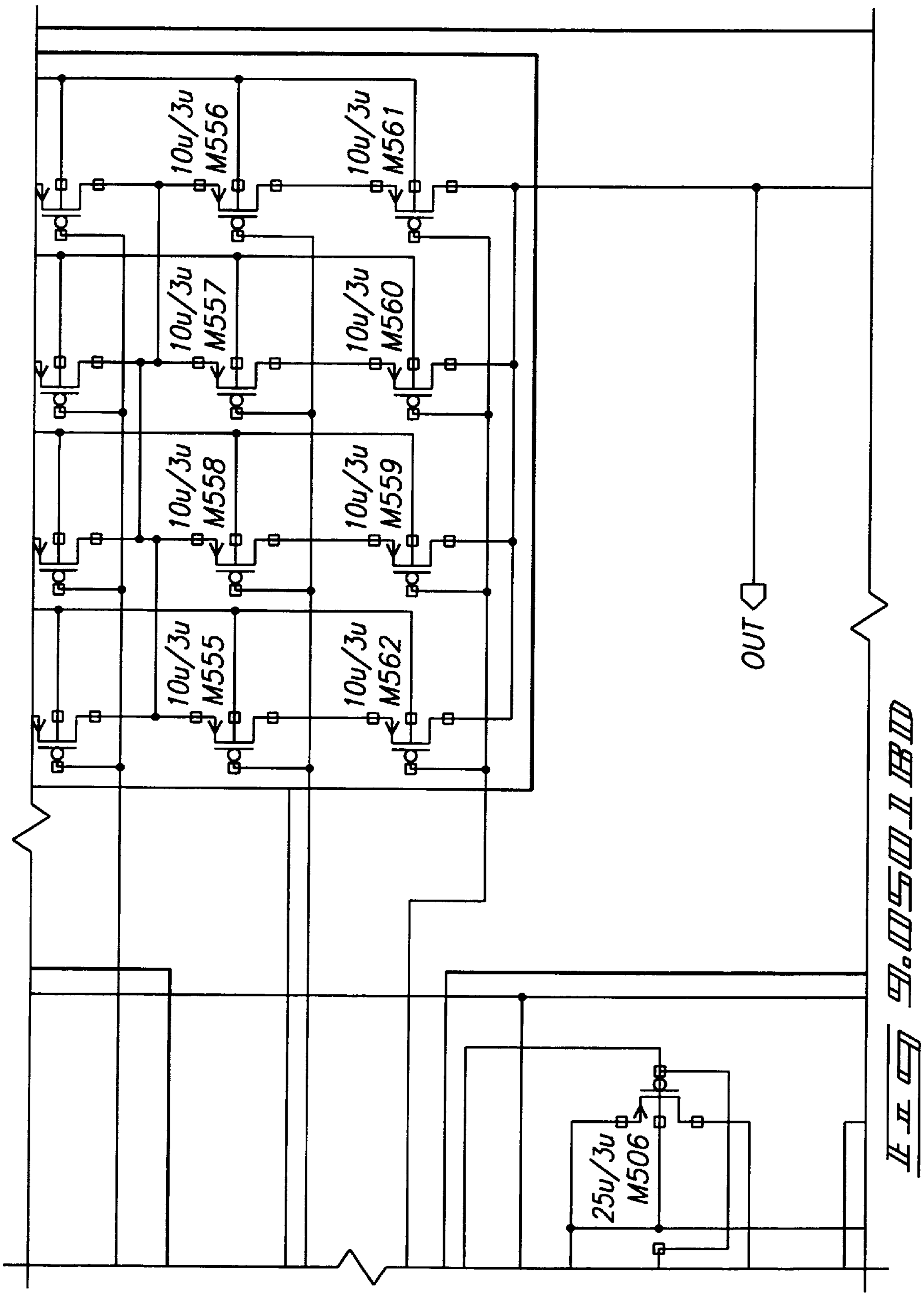
Fig. 9.050IIBD

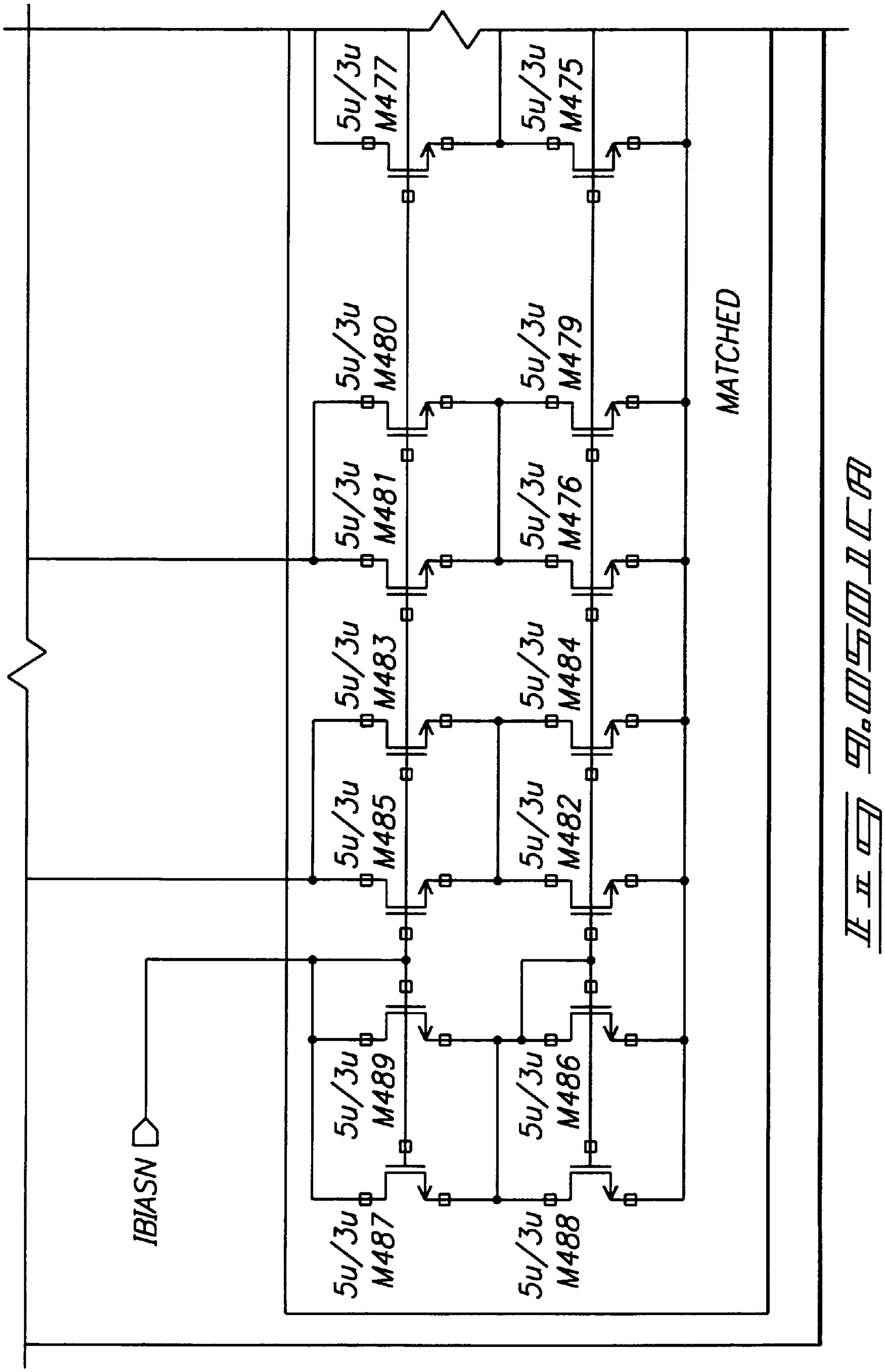
FIG. 9.05.01CA

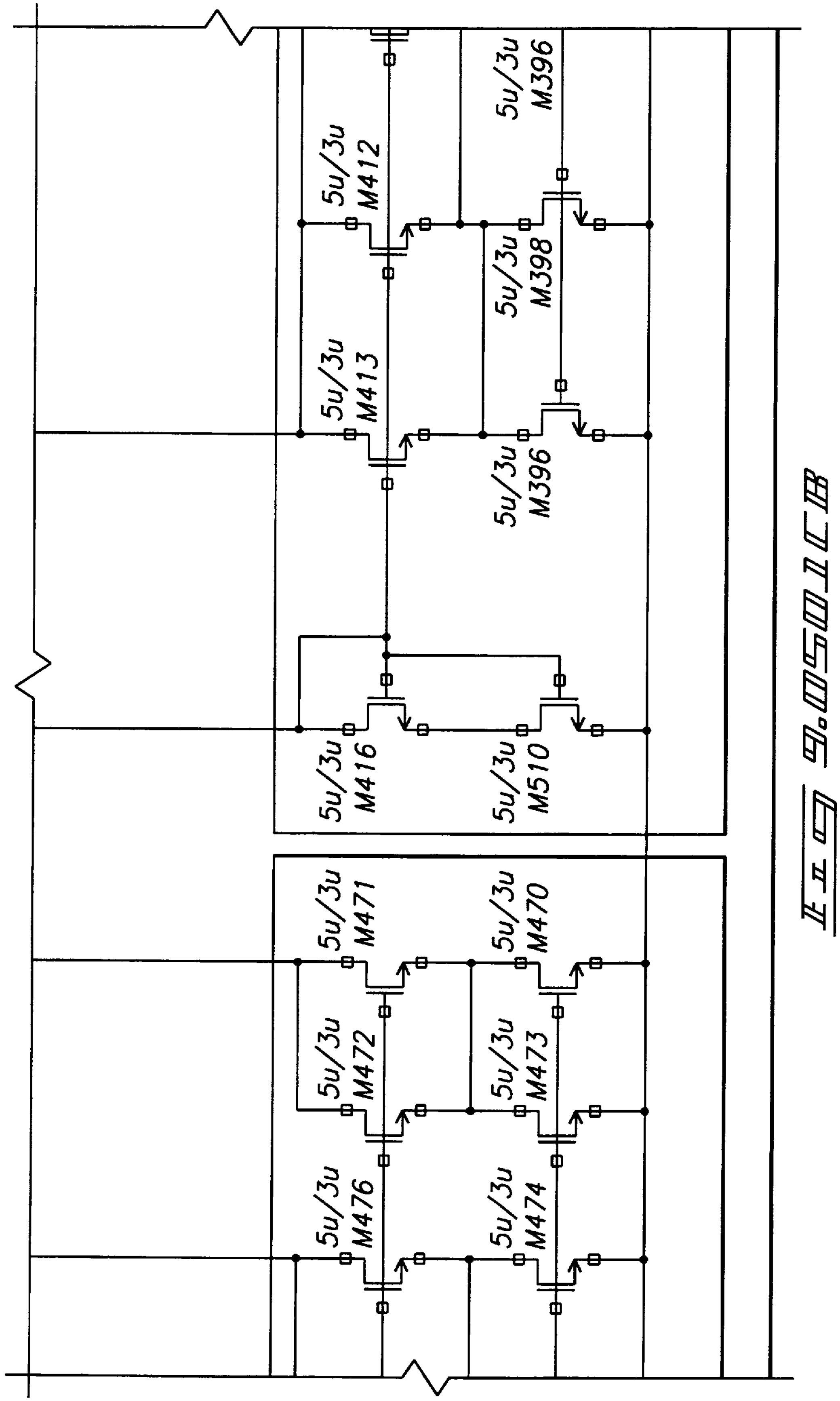
Fig 9.050ICB

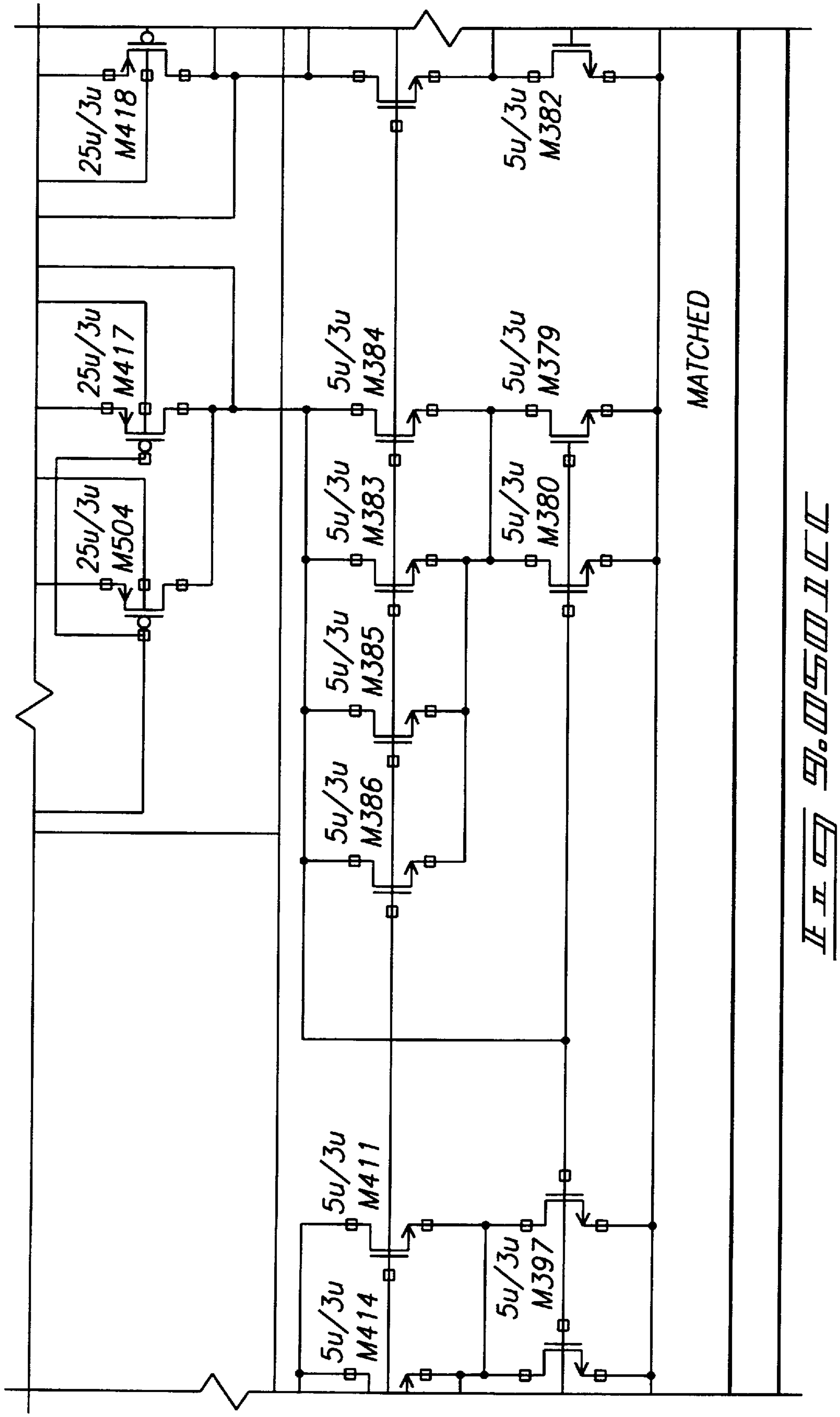
FIG. 9.050ICC

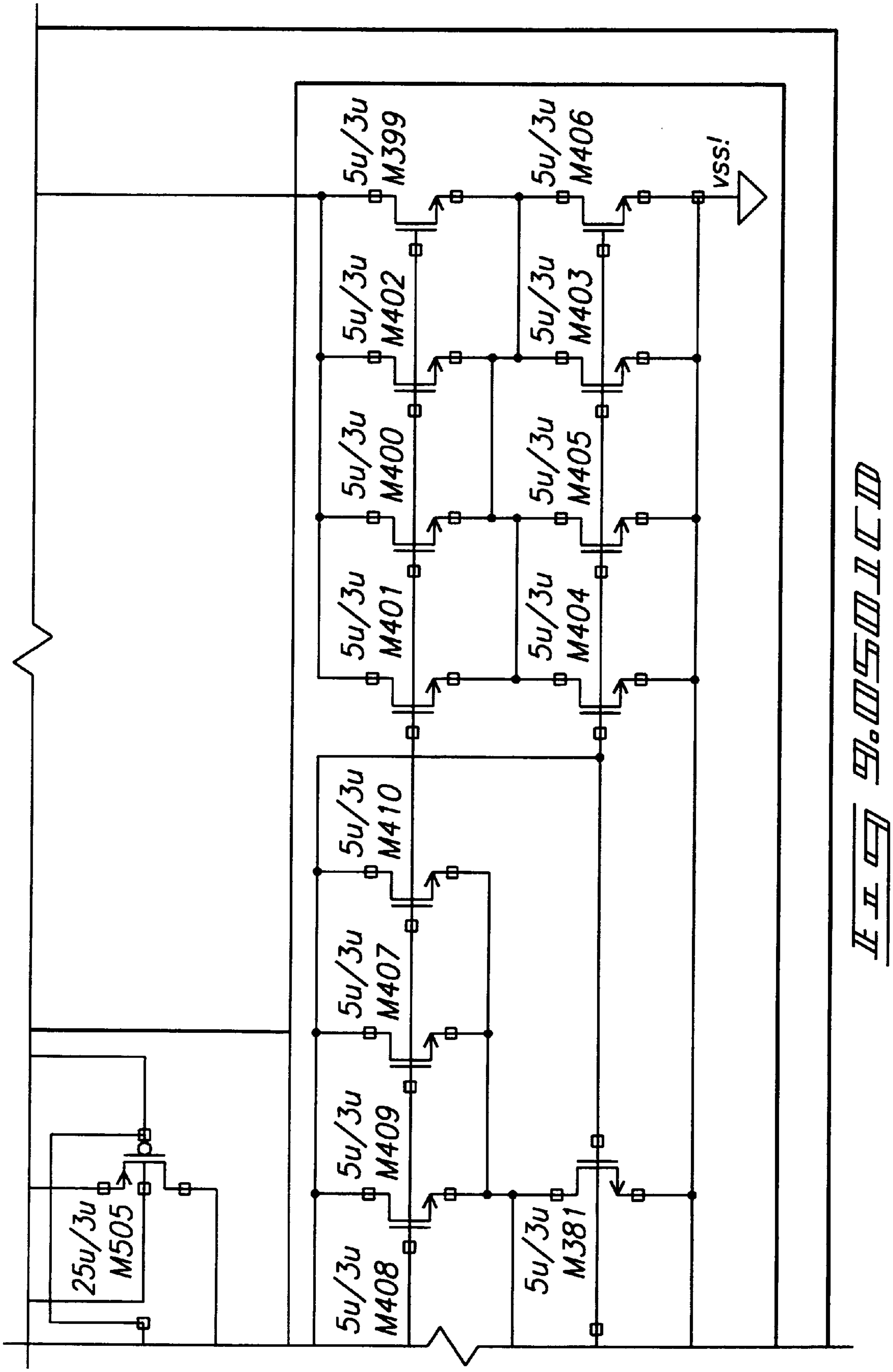
Fig 9.050ICD

| | | | | |
|---|---|---|---|---|
| 9.06AA | 9.06AB | 9.06AC | 9.06AD | 9.06AE |
| 9.06BA | 9.06BB | 9.06BC | 9.06BD | 9.06BE |
| 9.06CA | 9.06CB | 9.06CC | 9.06CD | |
| 9.06DA | 9.06DB | 9.06DC | 9.06DD | |

Fig 9.06

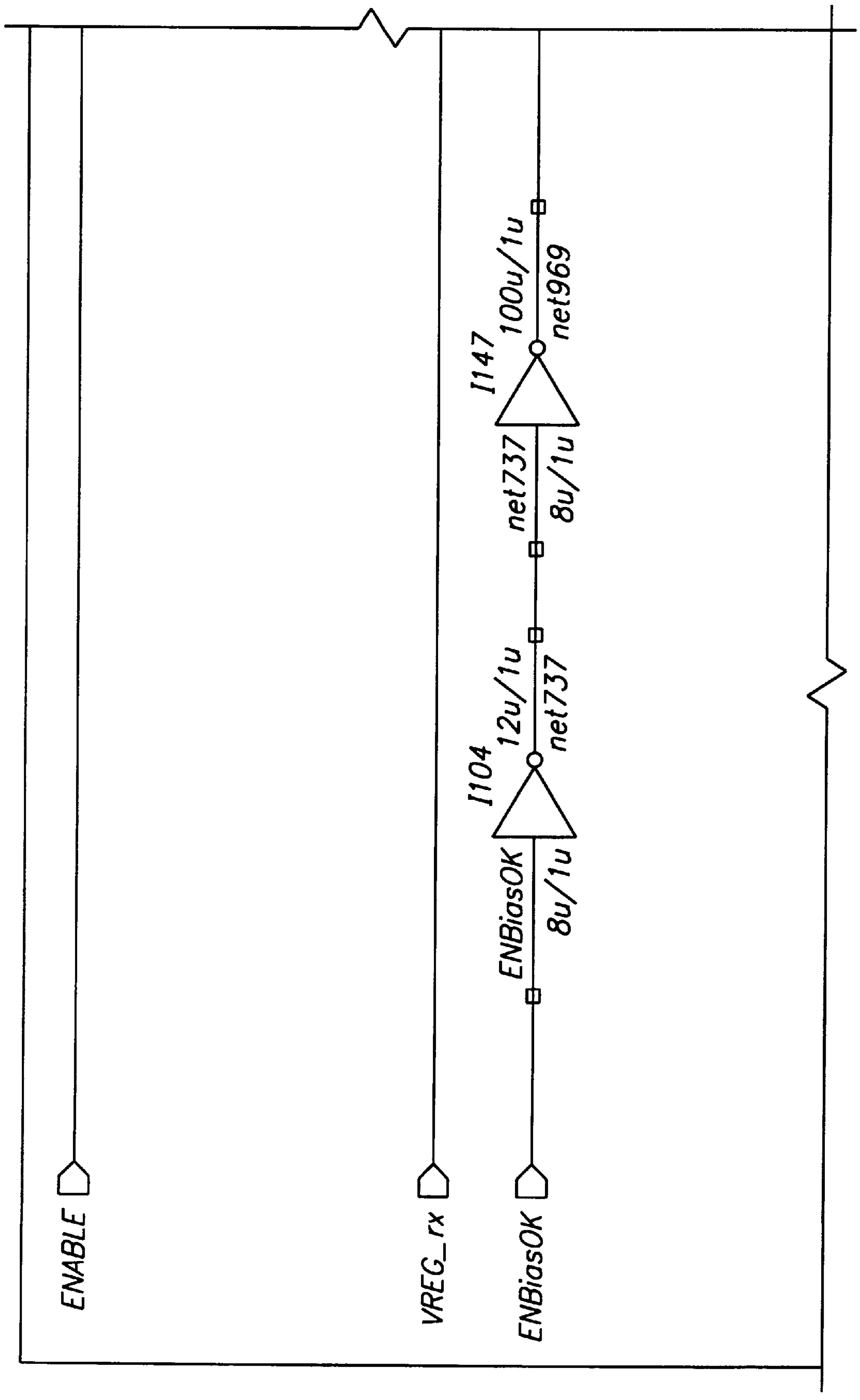
Fig. 9.06AA

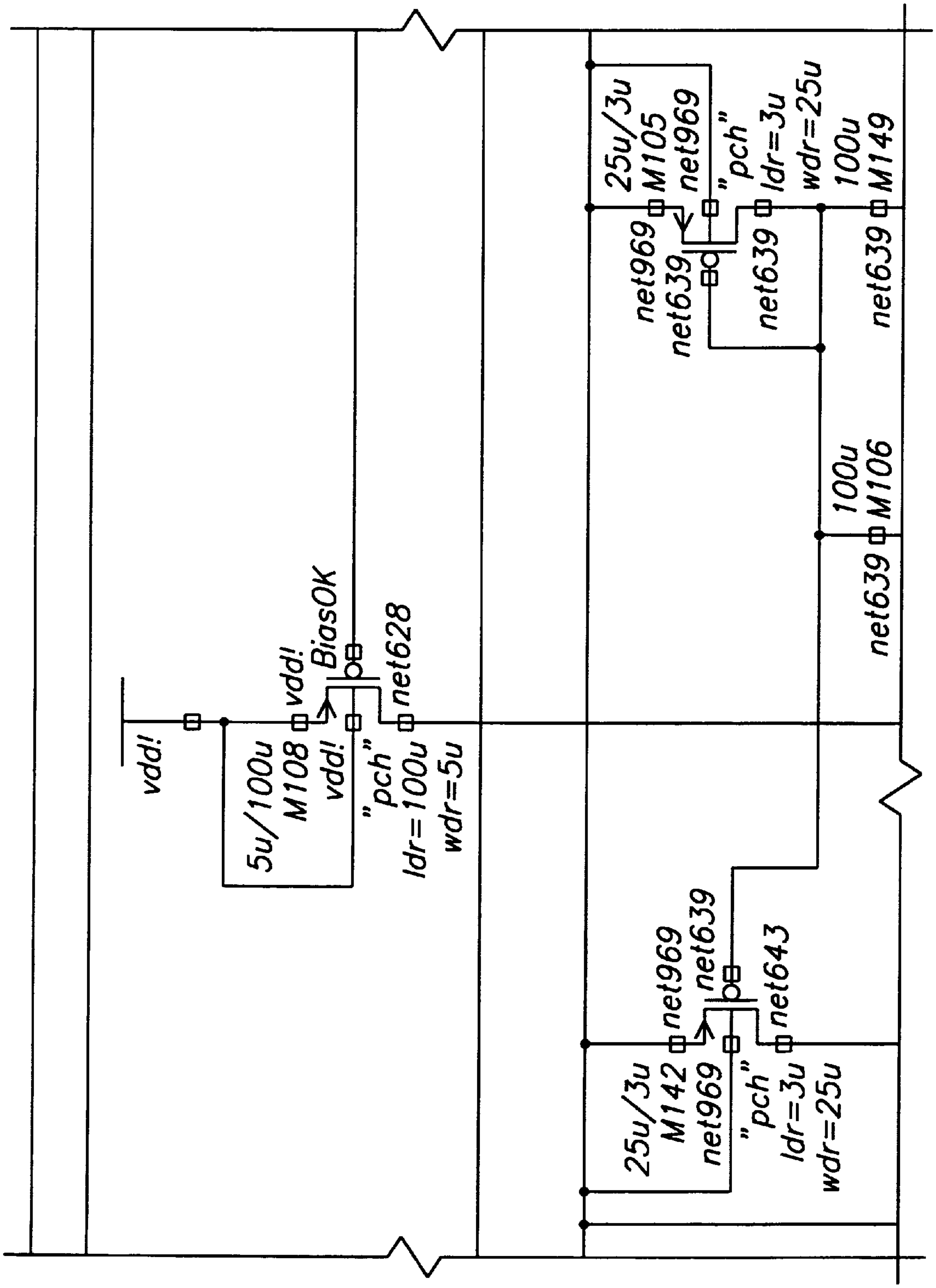
FIG. 9.06AB

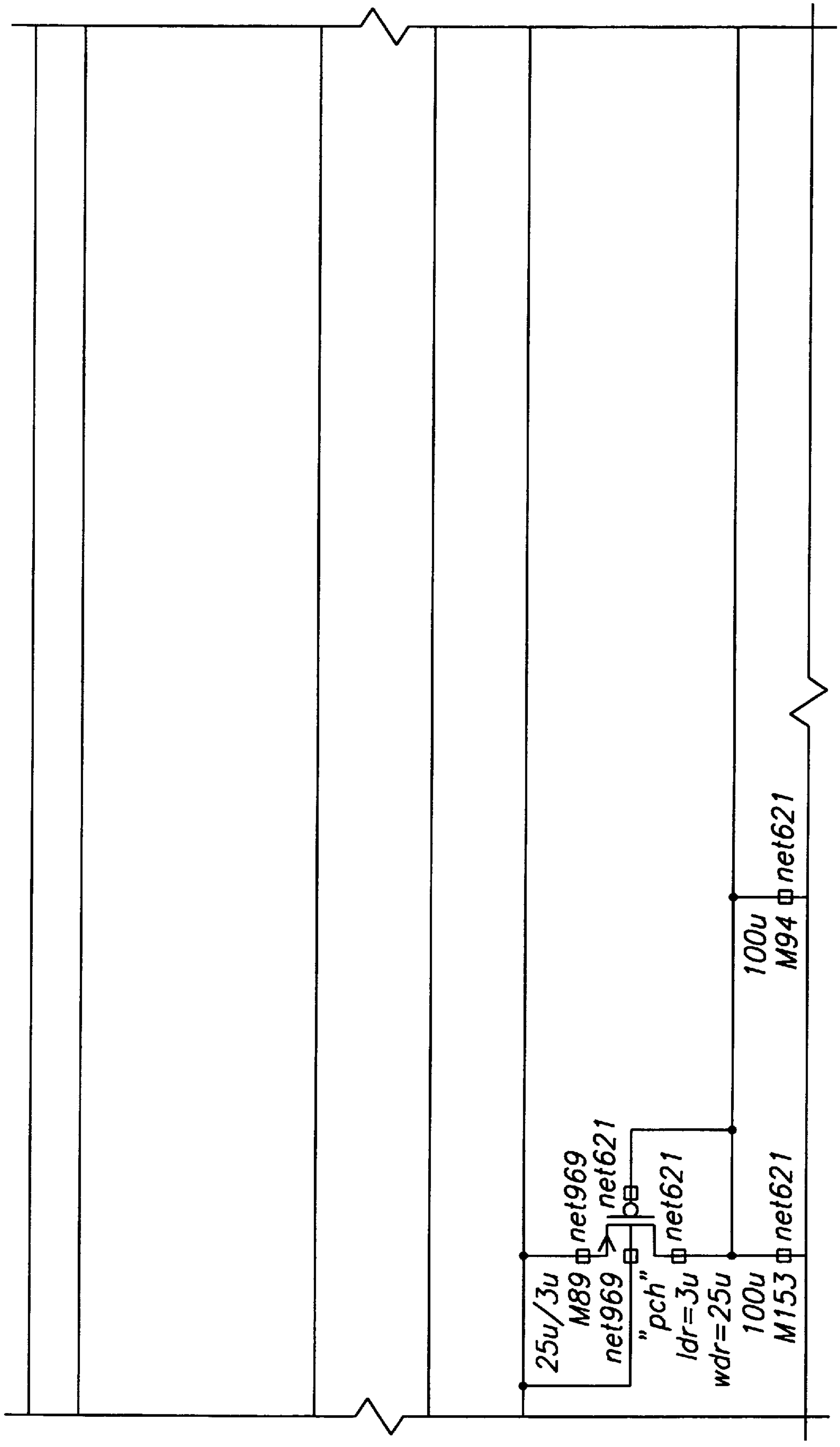
FIG. 9.06AC

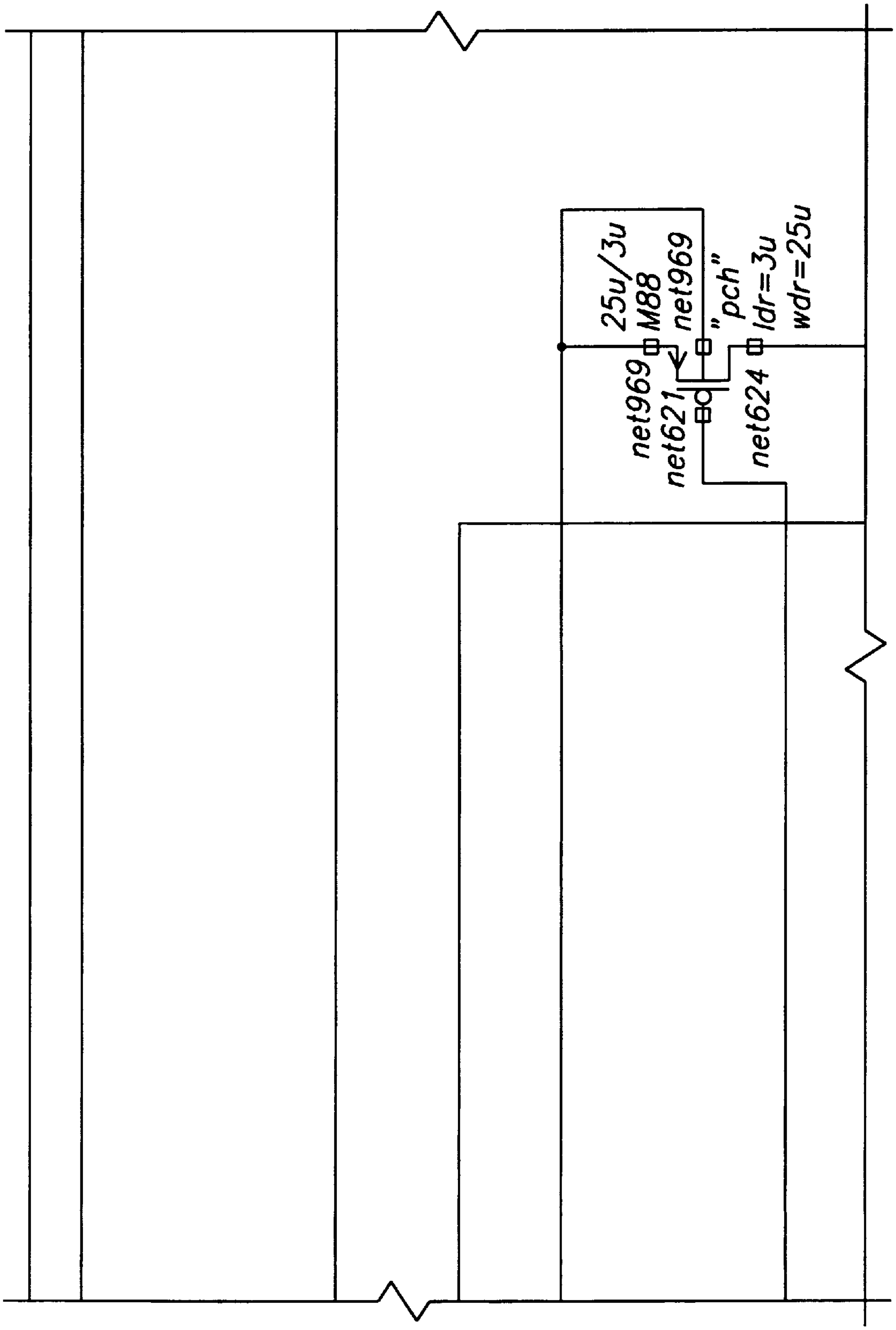
FIG. 9.06AD

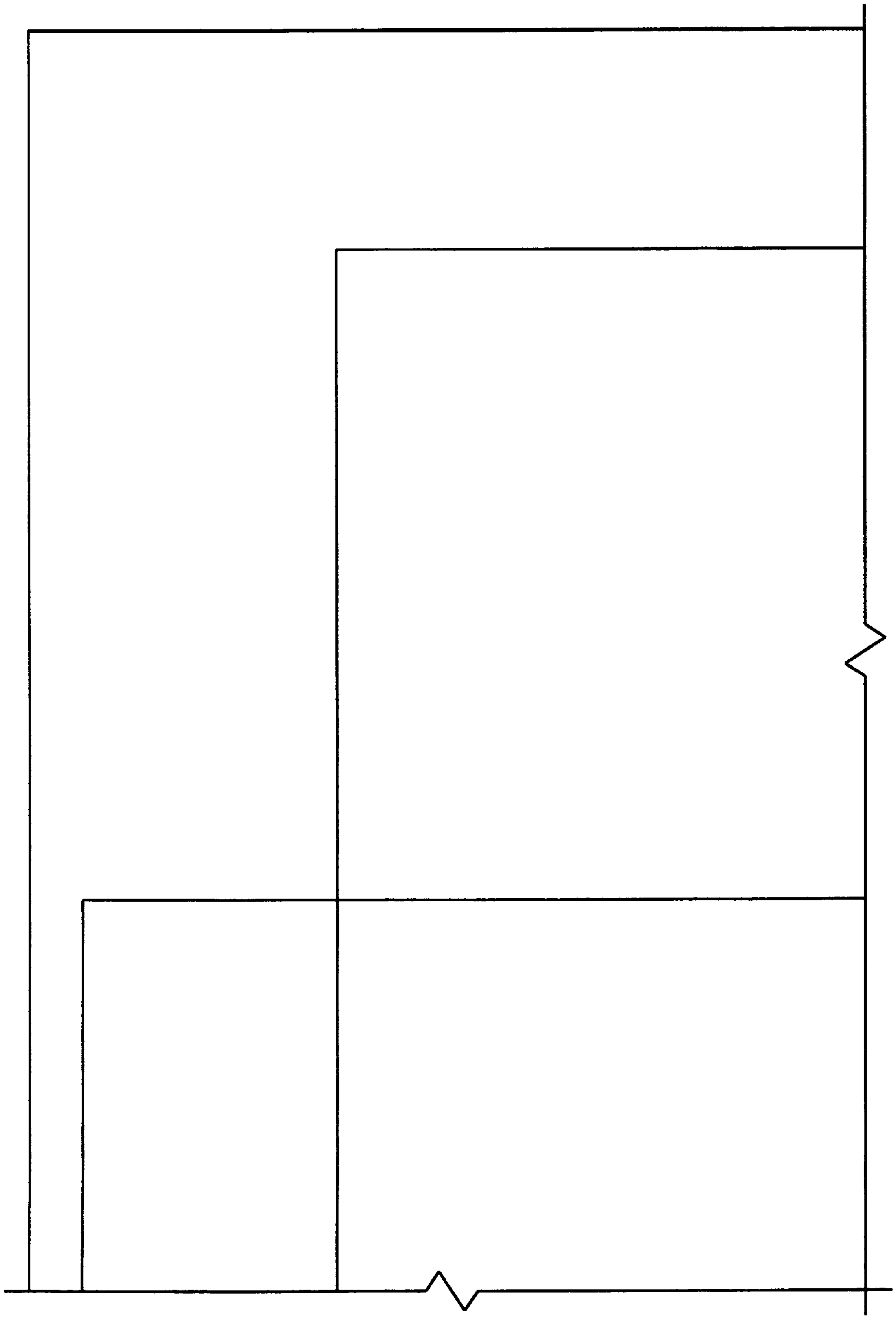
Fig. 9.006AE

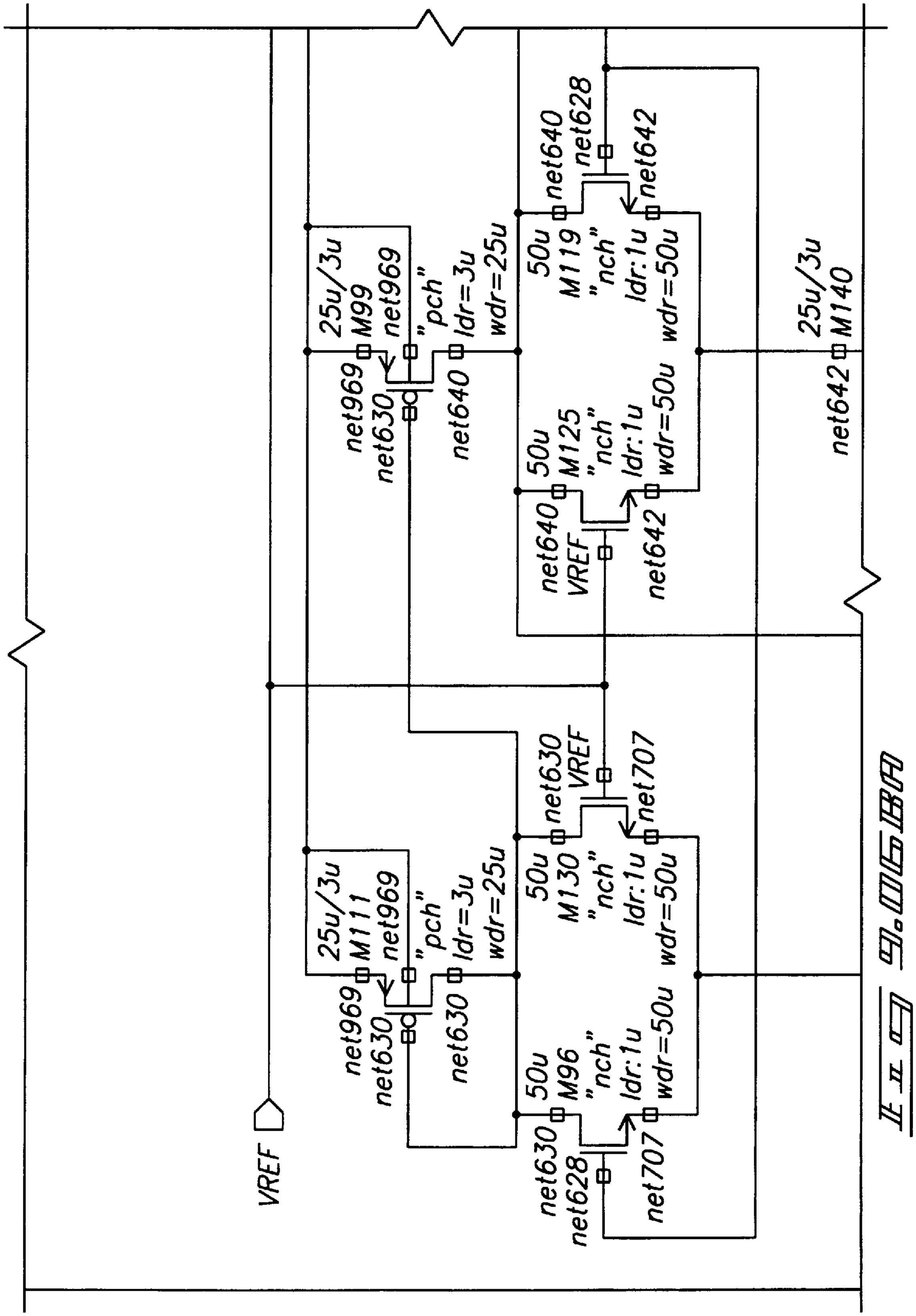
25u/3u
M99
net969
"pch"
ldr=3u
wdr=25u
net969
net630
net640
50u
M119
"nch"
ldr:1u
wdr=50u
net640
net628
net642
50u
M125
"nch"
ldr:1u
wdr=50u
net640
VREF
net642
25u/3u
M140
net642
25u/3u
M111
net969
"pch"
ldr=3u
wdr=25u
net969
net630
net630
50u
M130
"nch"
ldr:1u
wdr=50u
net630
VREF
net707
50u
M96
"nch"
ldr:1u
wdr=50u
net630
net628
net707
VREF

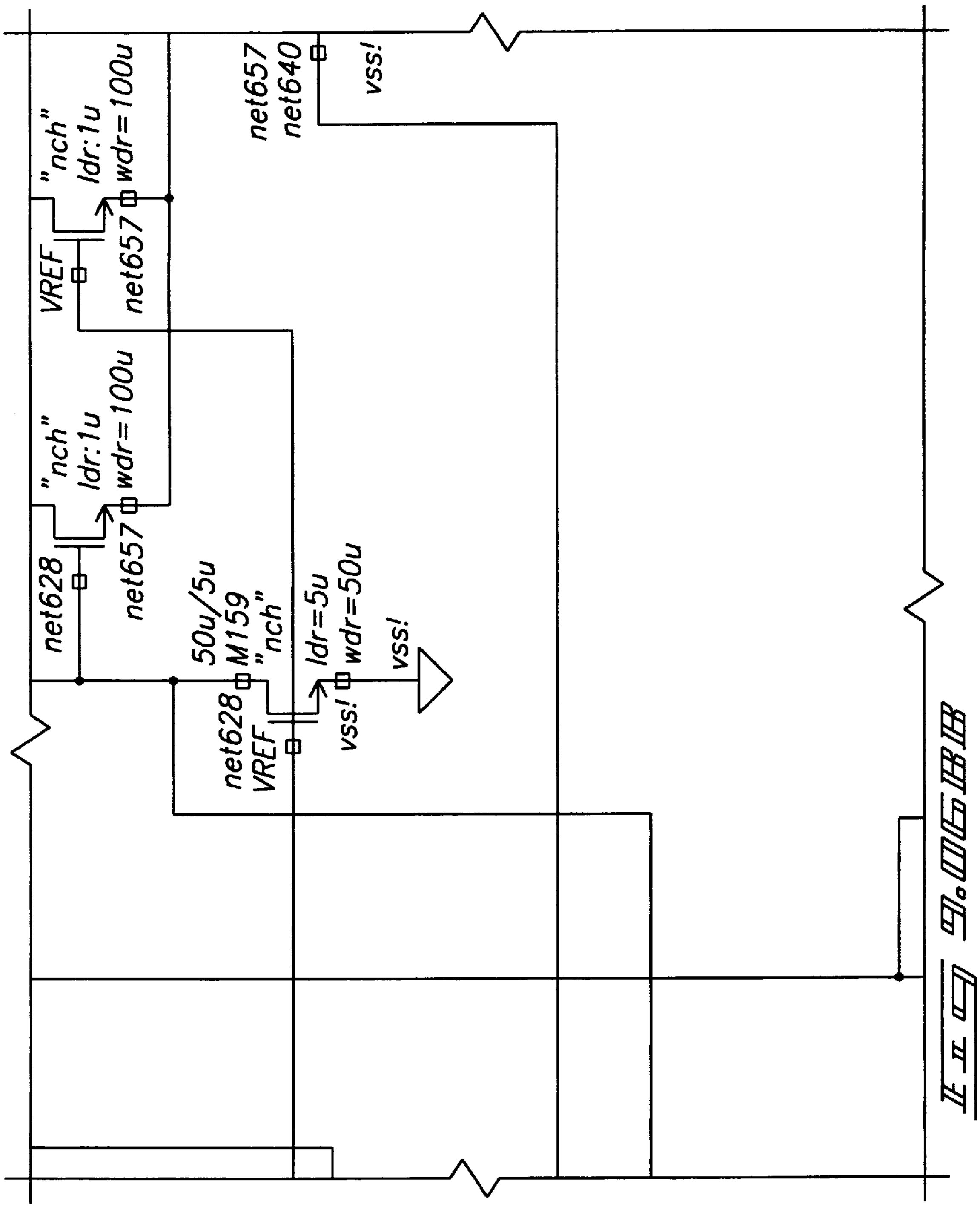
Fig. 9.06BB

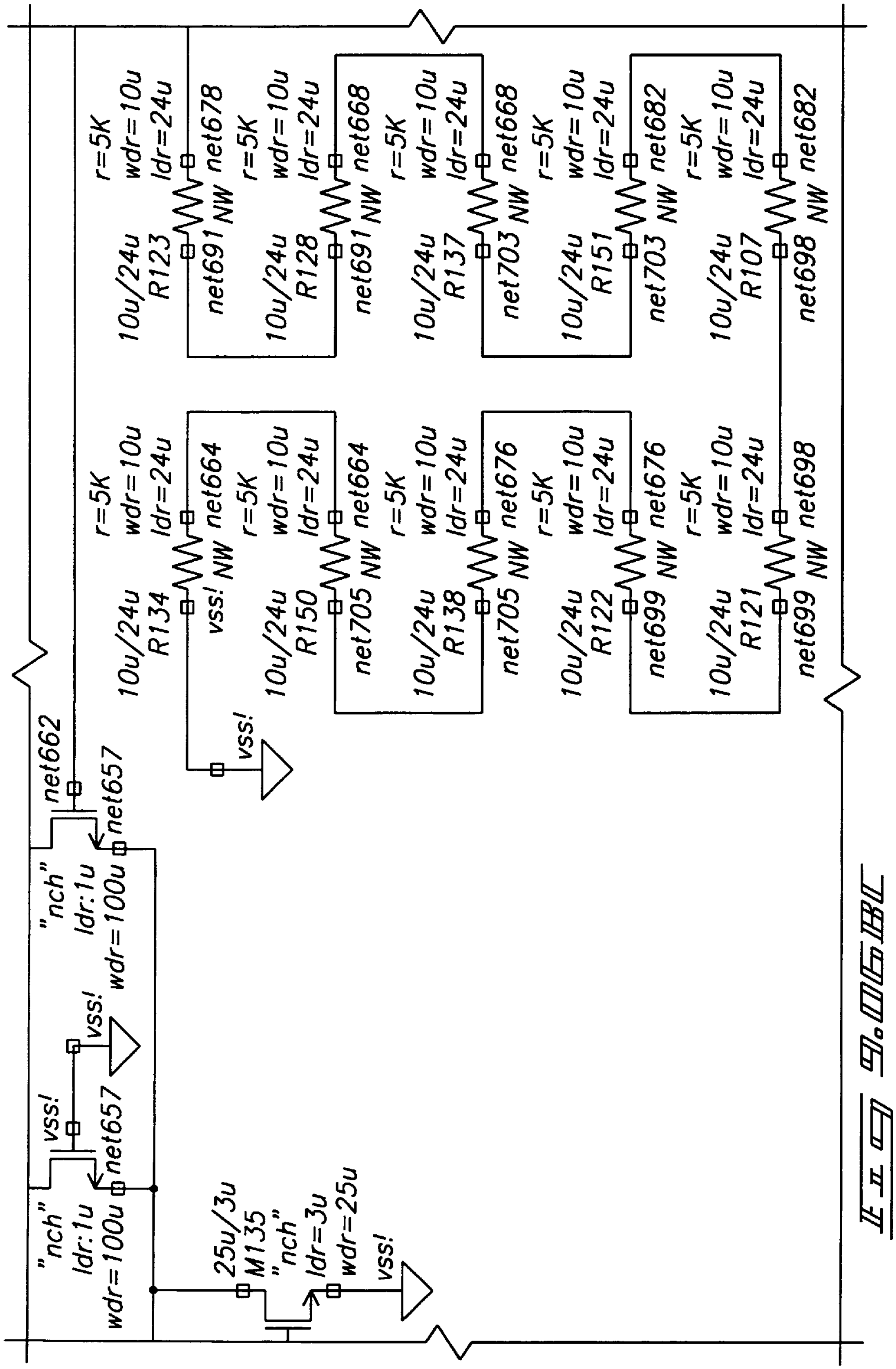
FIG. 9.06BC

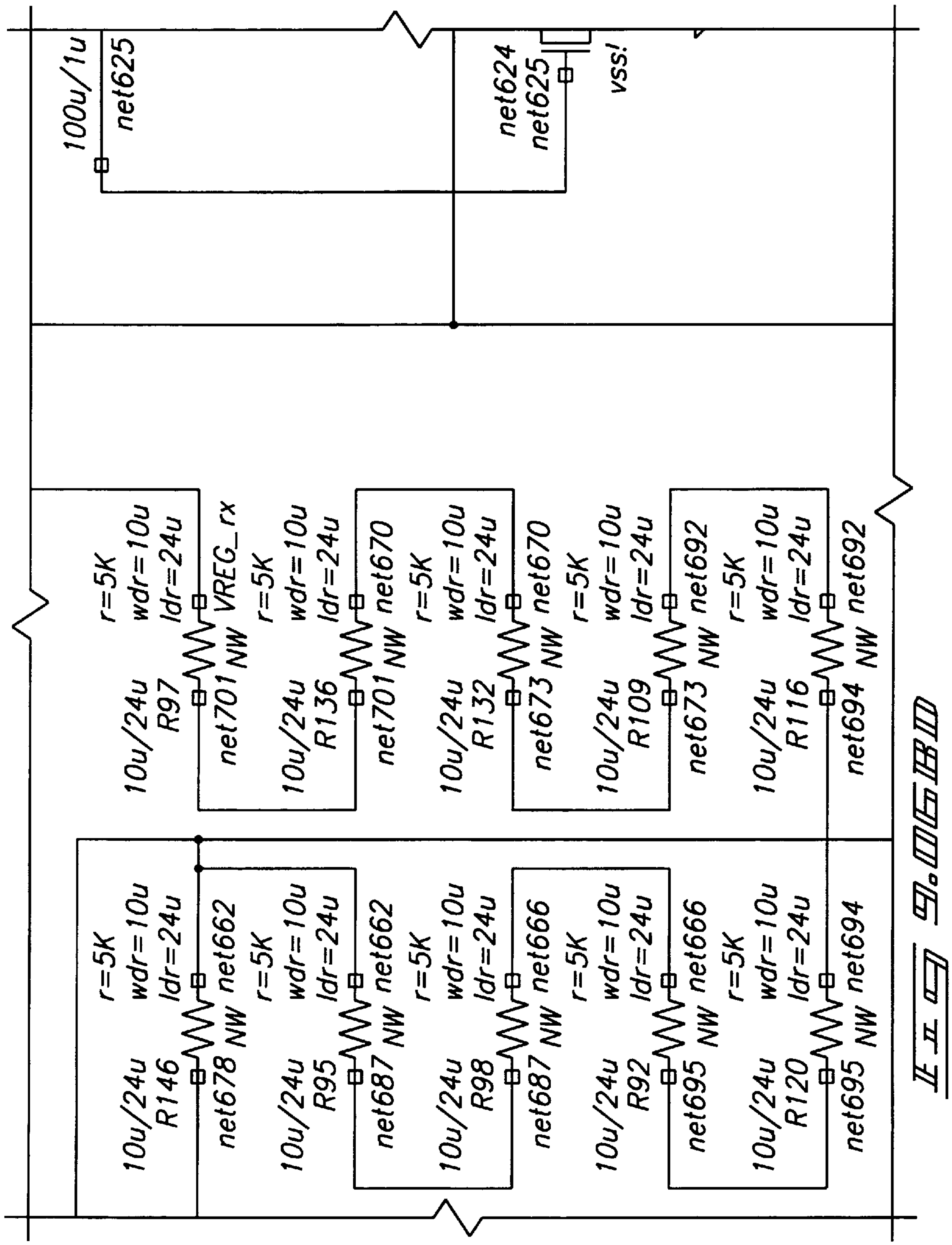
Fig. 9.06BD

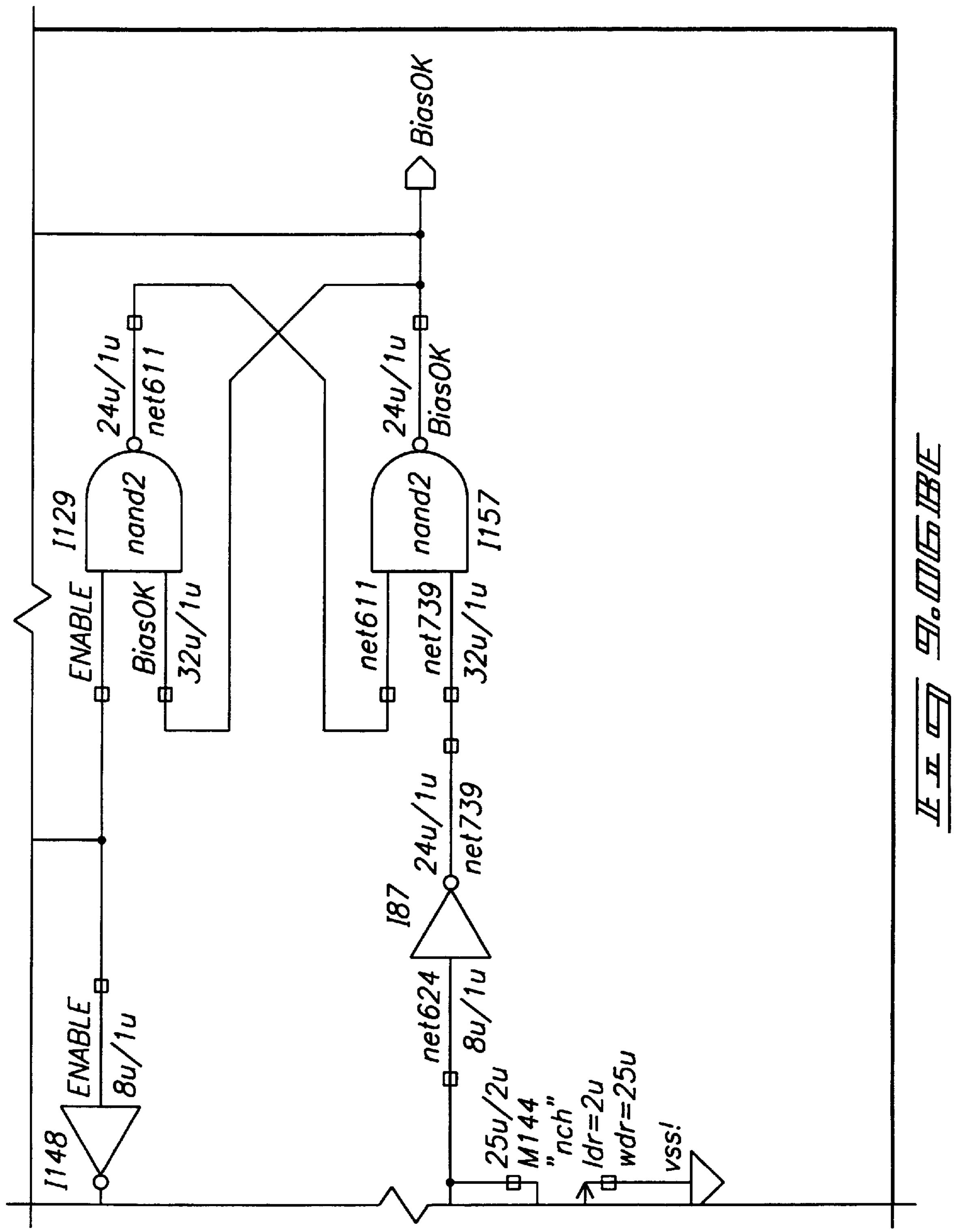
FIG. 9.06BE

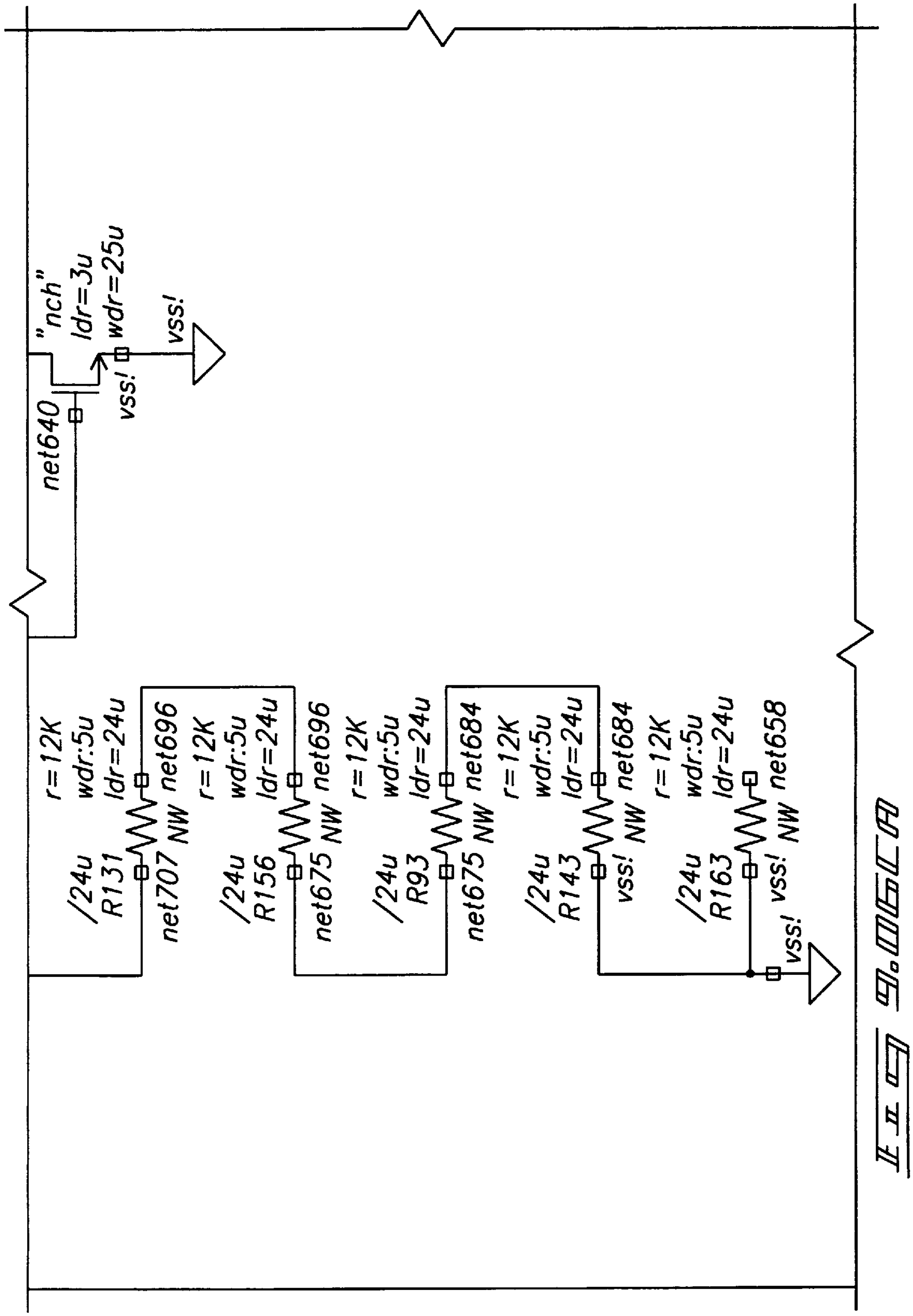
FIG. 9.06CA

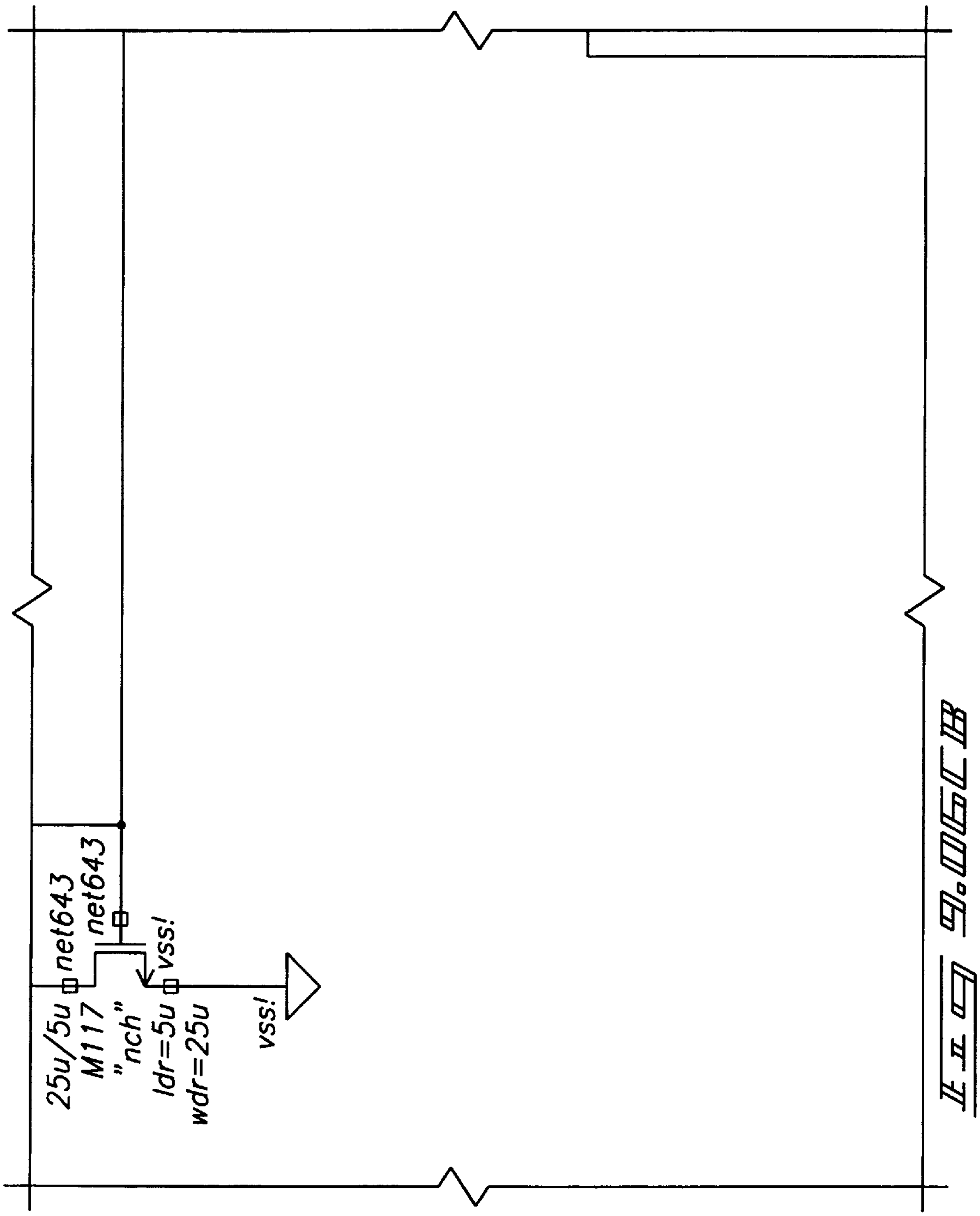
FIG. 9.06CB

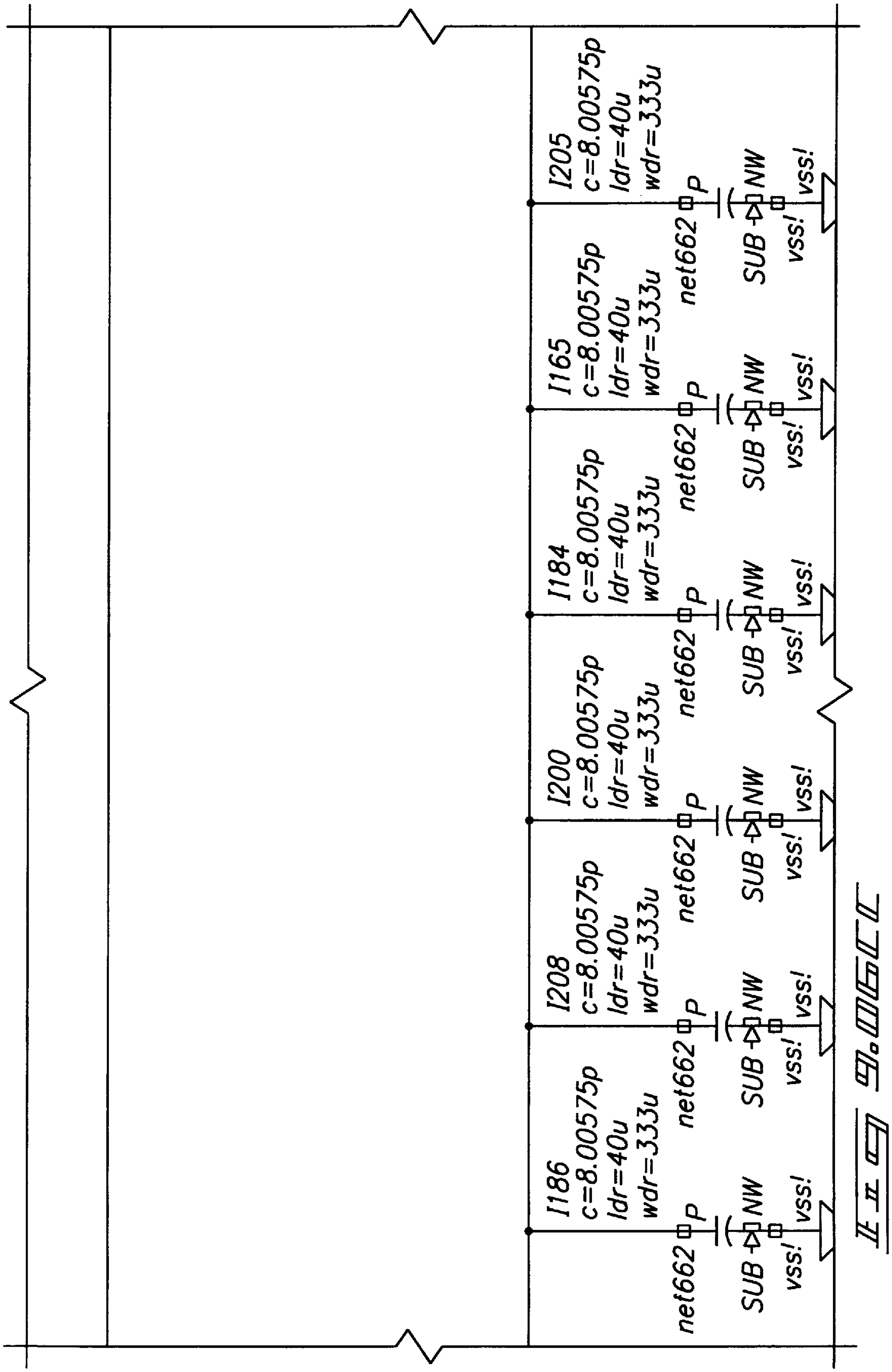
Fig. 9.06CC

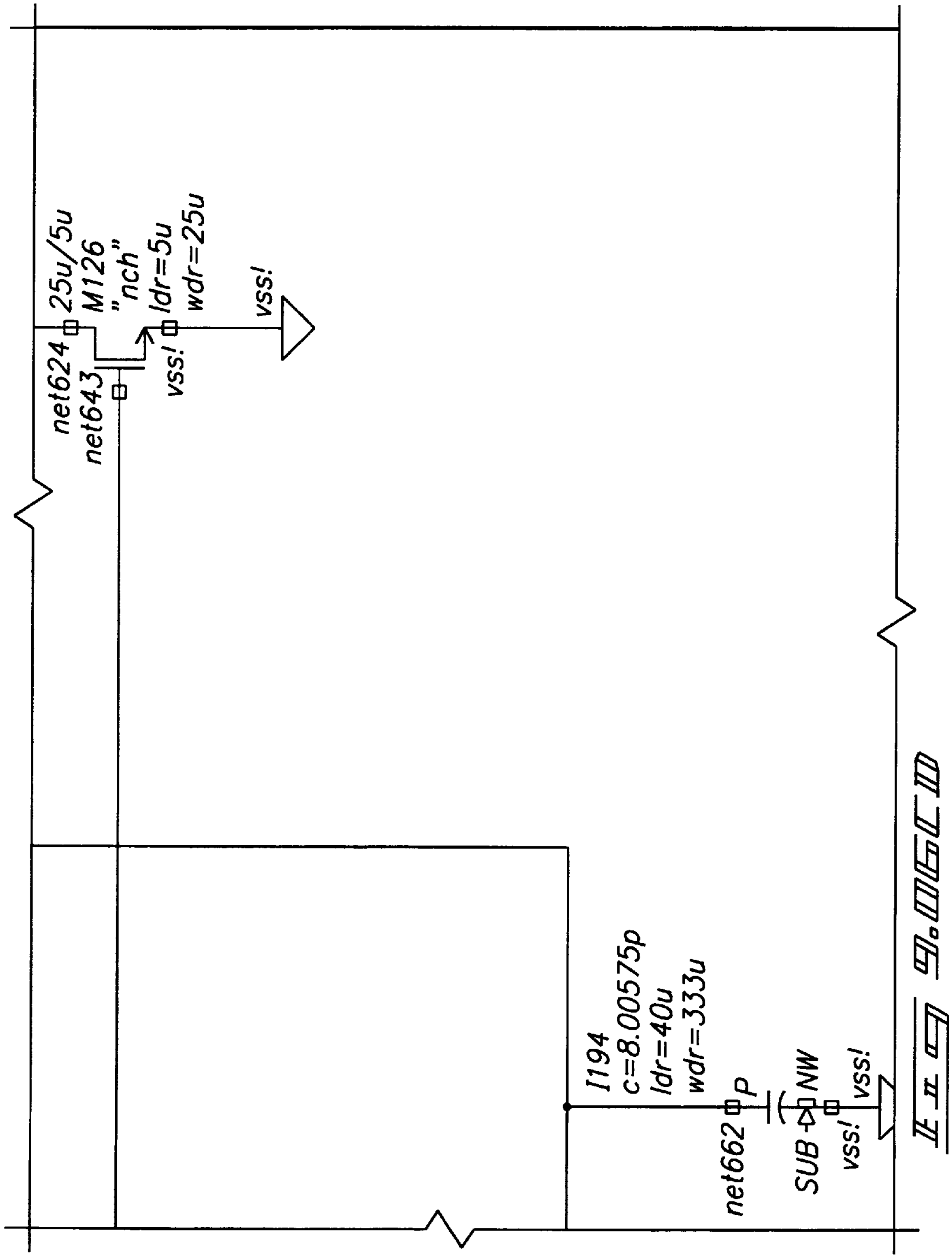
FIG. 9.06CD

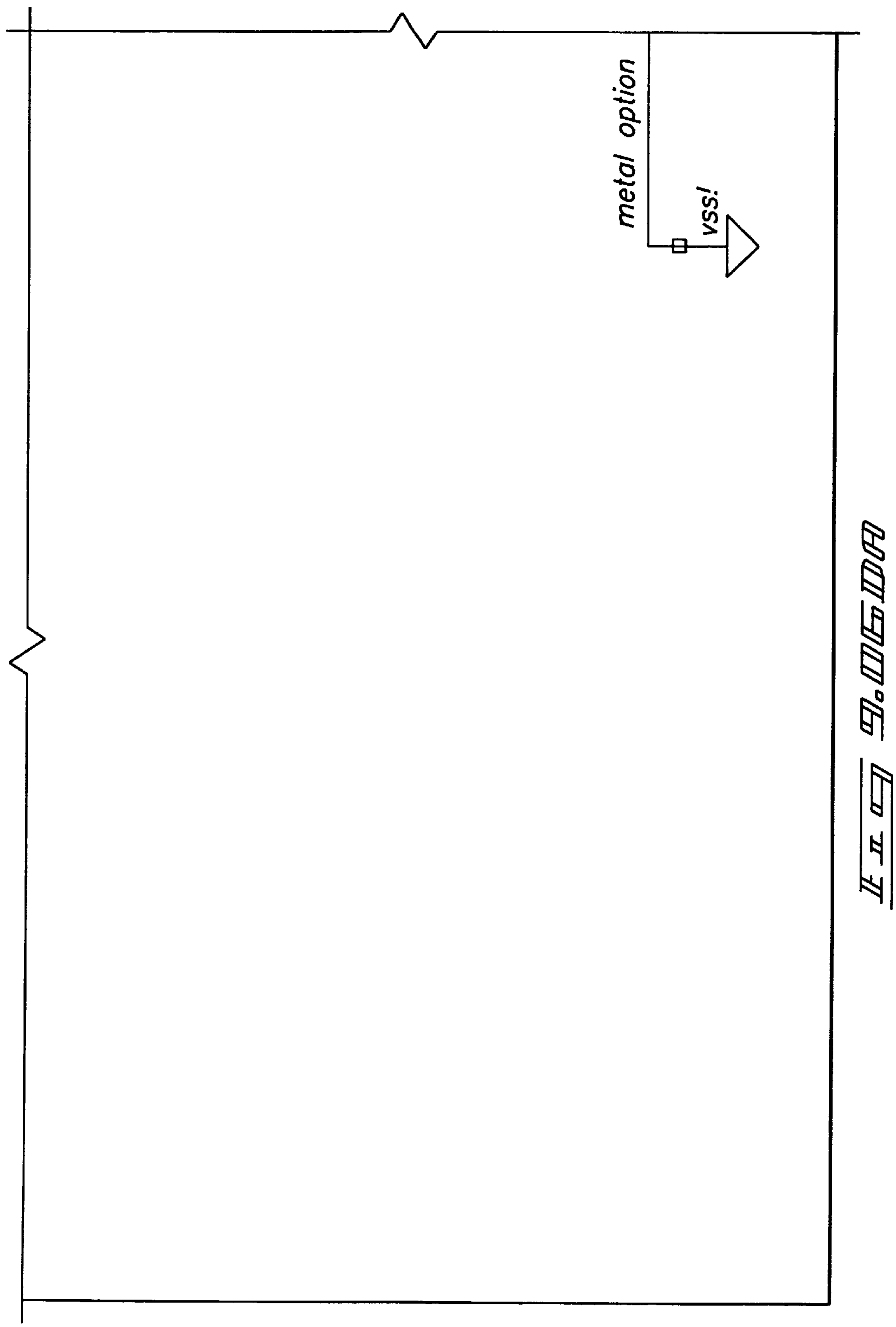
FIG. 9.06DA

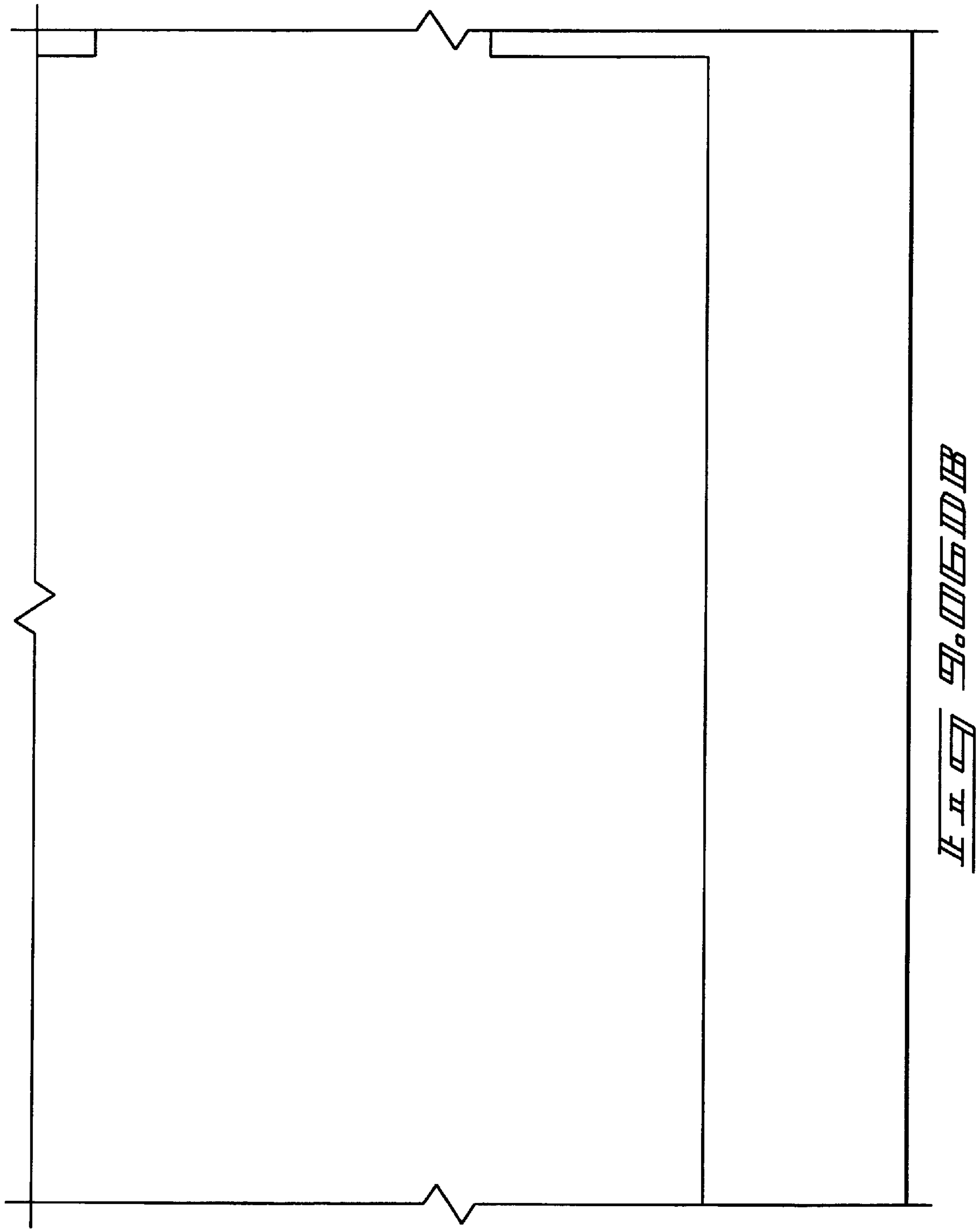
FIG. 9.06B

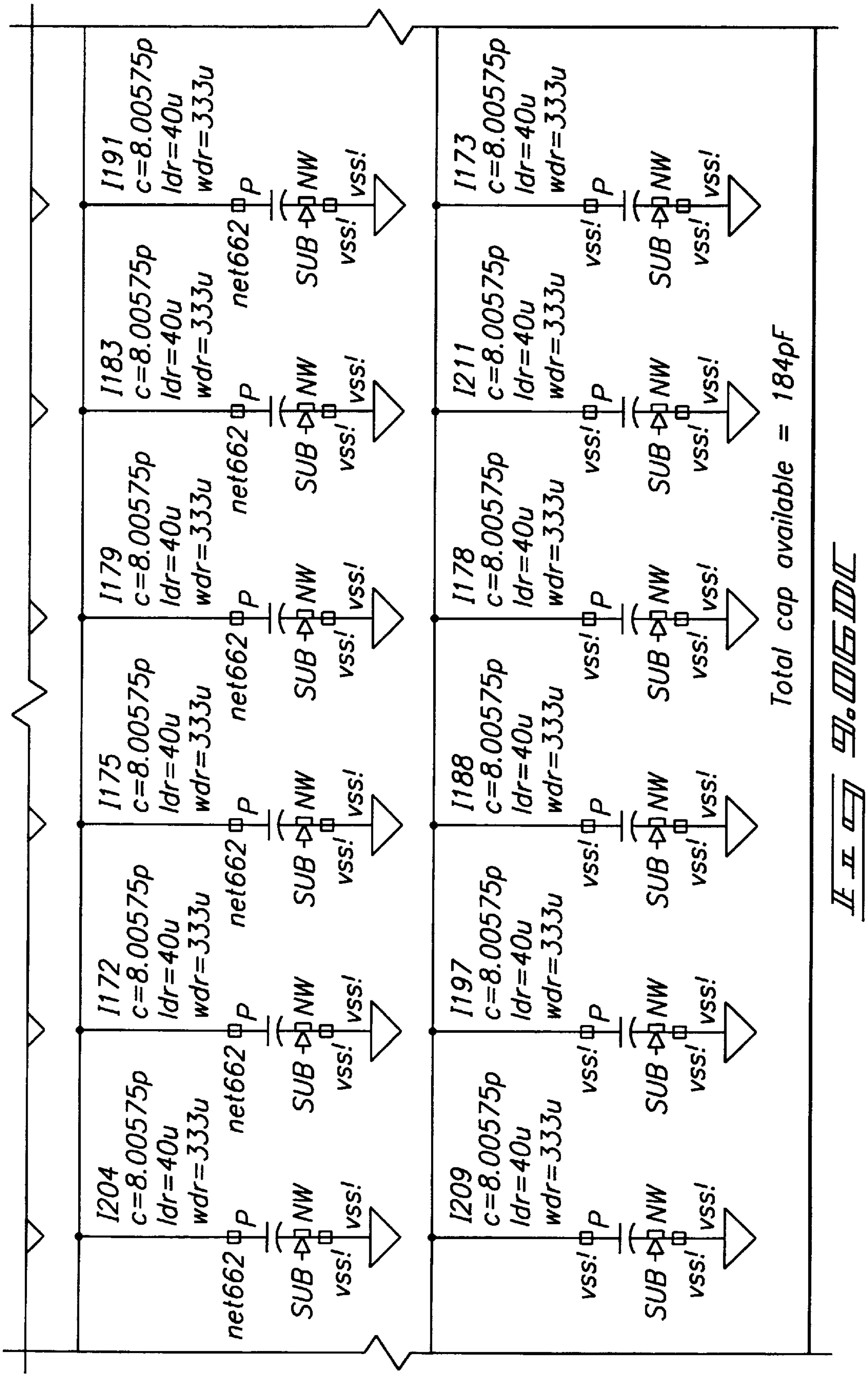
Fig 9.06DC

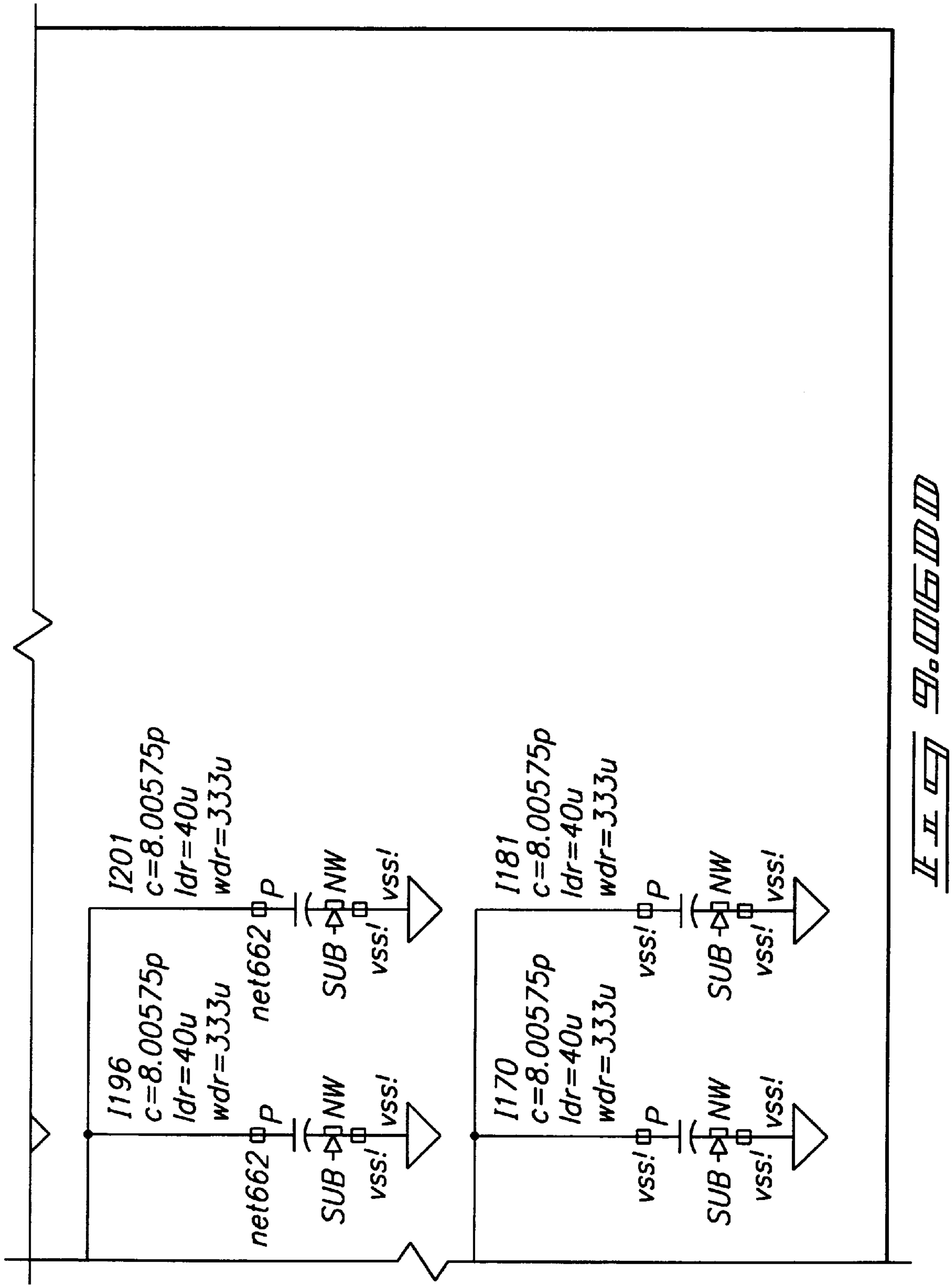
FIG. 9.06DD

| | | | | | | | | |
|---|---|---|---|---|---|---|---|---|
| 9.07AA | 9.07AB | 9.07AC | 9.07AD | 9.07AE | 9.07AF | 9.07AG | 9.07AH | 9.07AI |
| 9.07BA | 9.07BB | 9.07BC | 9.07BD | 9.07BE | 9.07BF | 9.07BG | 9.07BH | 9.07BI |
| 9.07CA | 9.07CB | 9.07CC | 9.07CD | 9.07CE | 9.07CF | 9.07CG | 9.07CH | |
| 9.07DA | 9.07DB | 9.07DC | 9.07DD | 9.07DE | 9.07DF | 9.07DG | | |
| 9.07EA | 9.07EB | 9.07EC | 9.07ED | 9.07EE | 9.07EF | 9.07EG | | |

Fig. 9.07

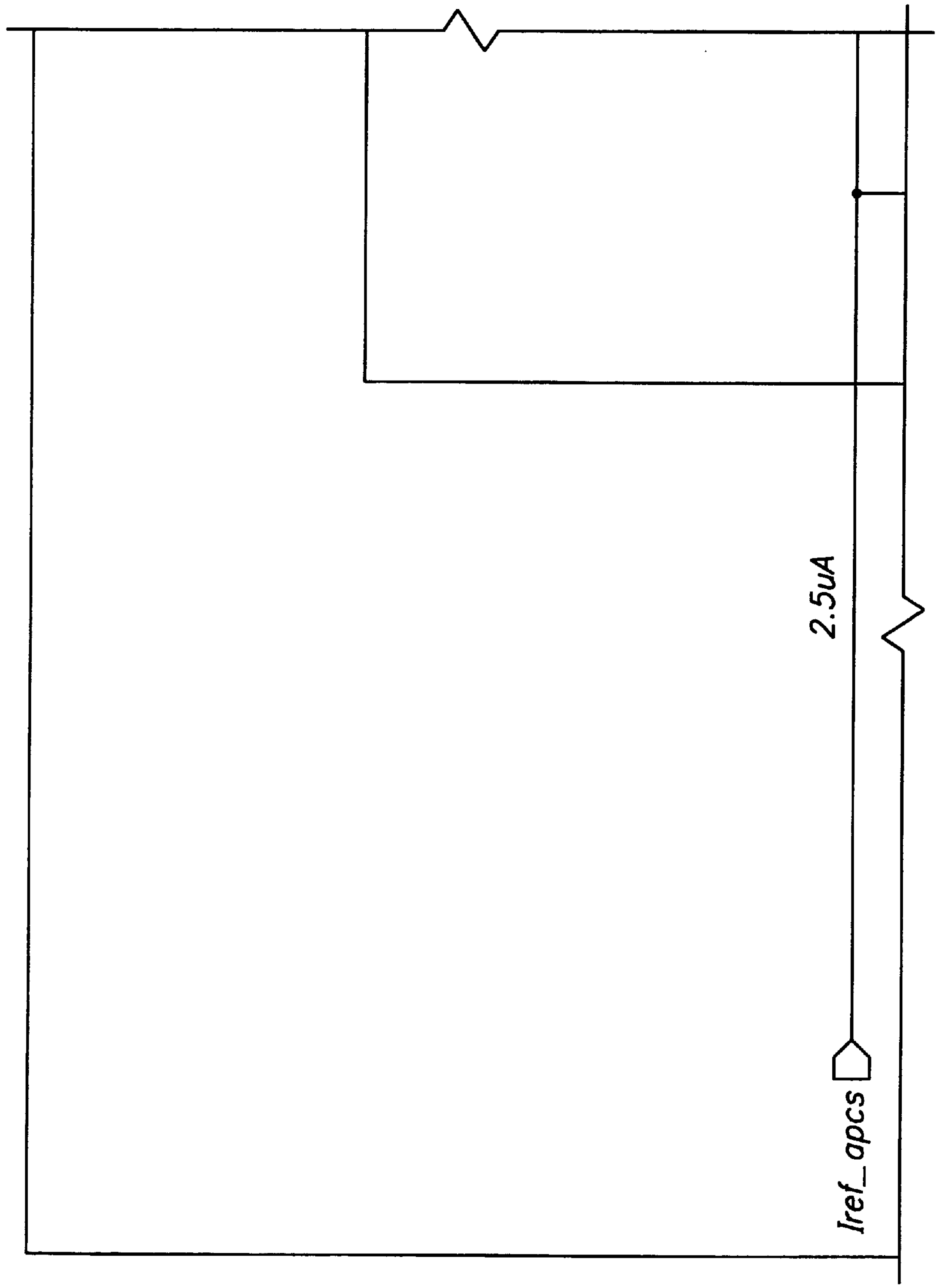
FIG. 9.07AA

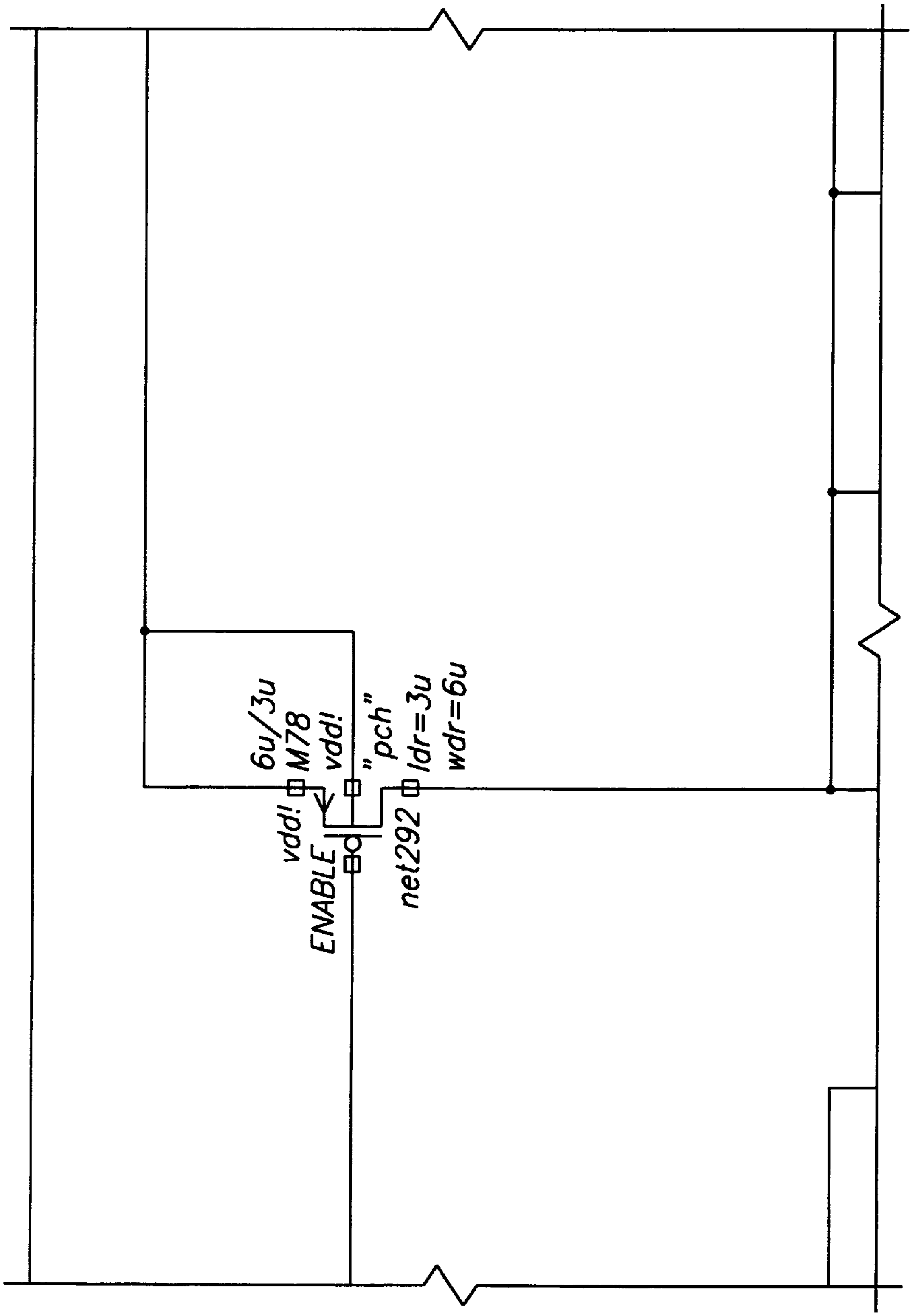
FIG. 9.07AB

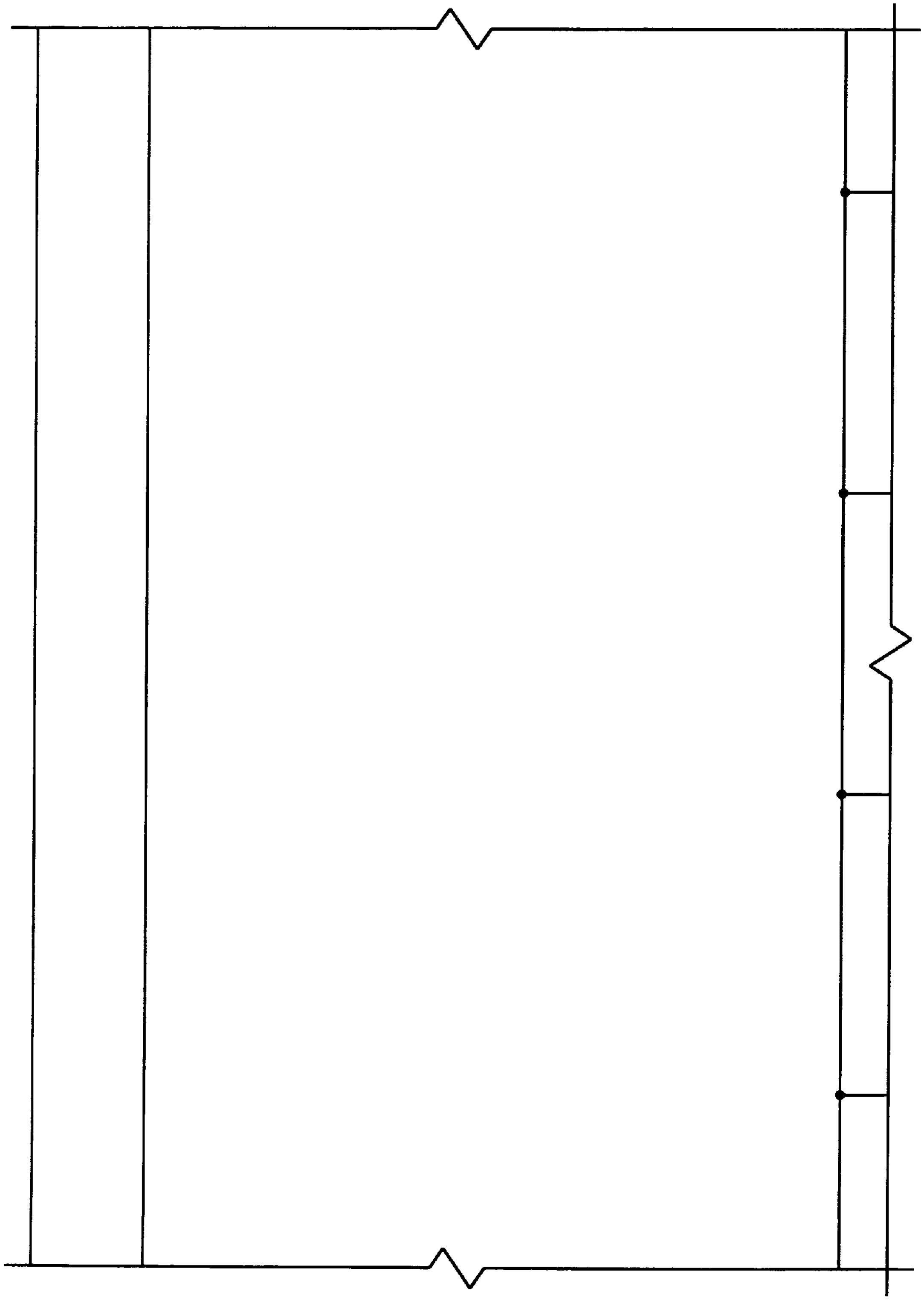
FIG. 9.07AC

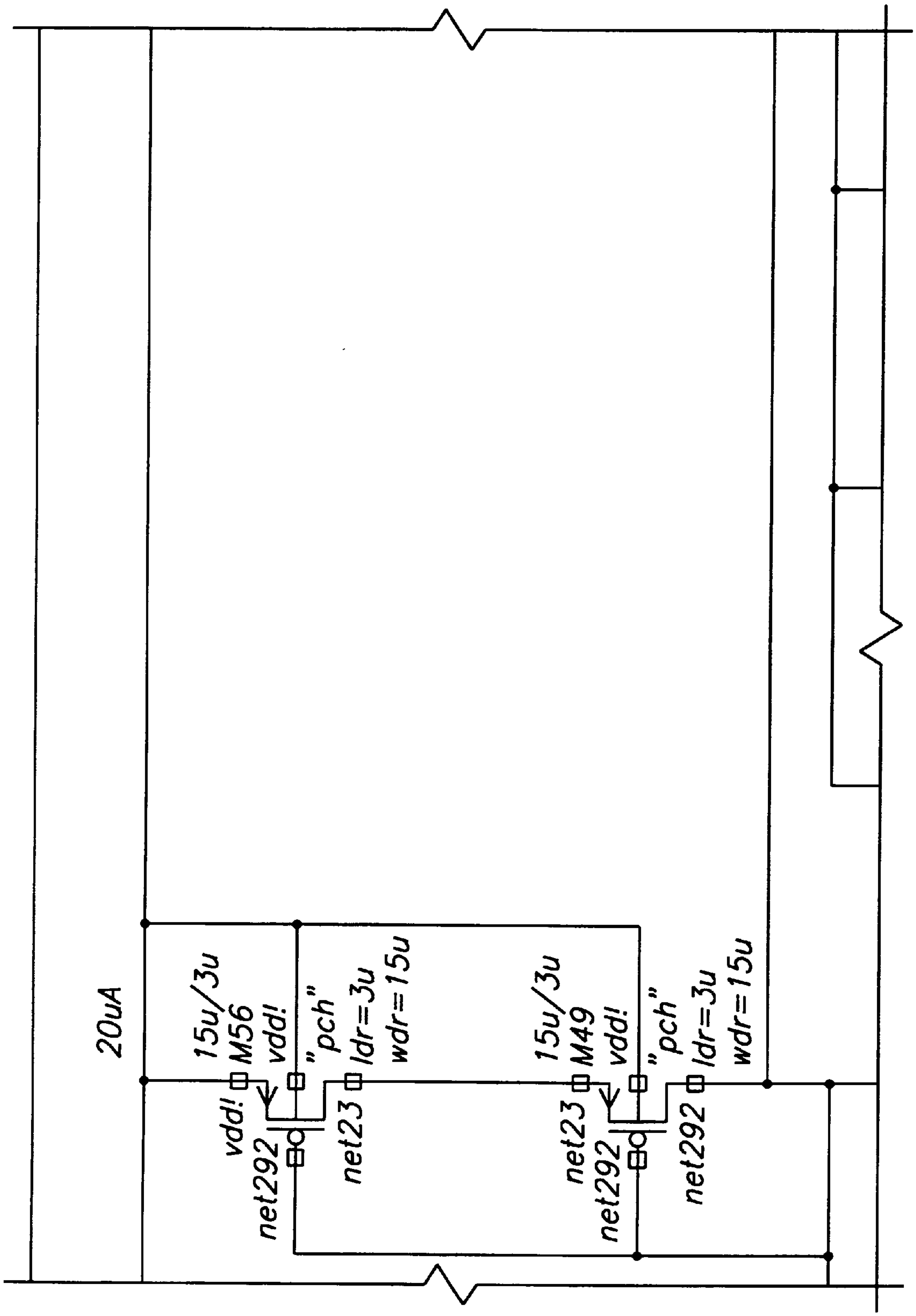
FIG. 9.10AD

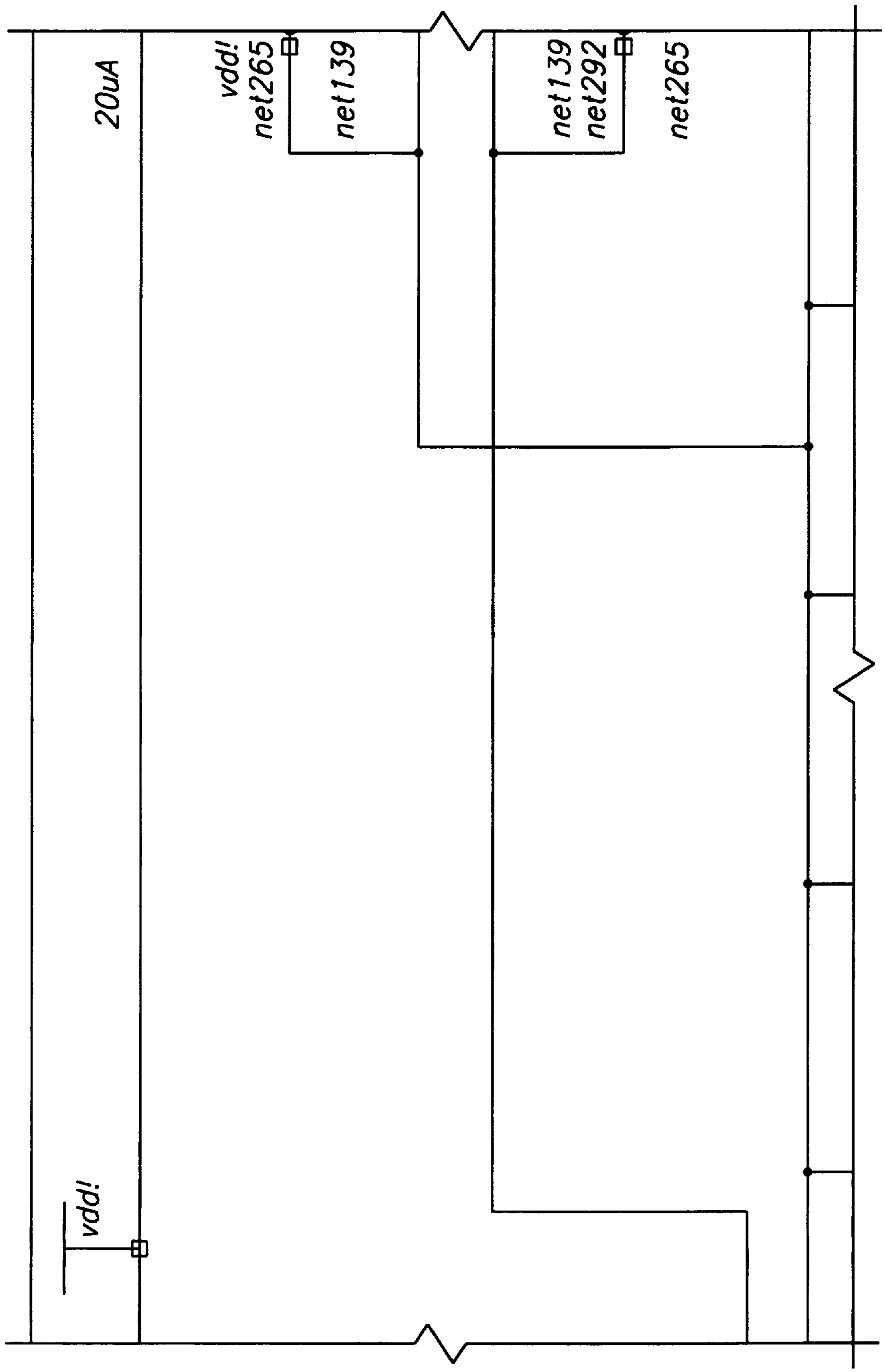
FIG. 9.07AE

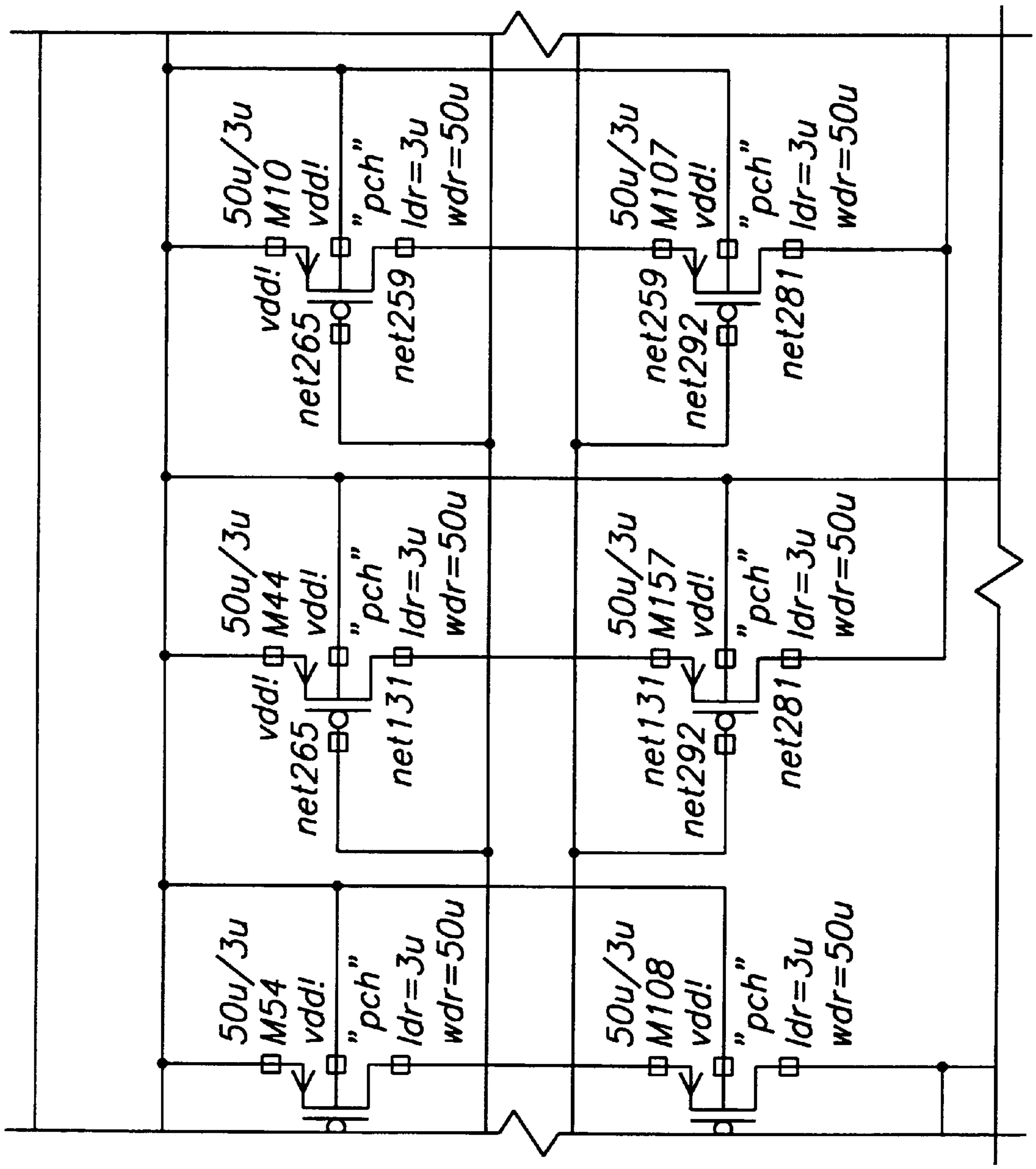
Fig 9.07AF

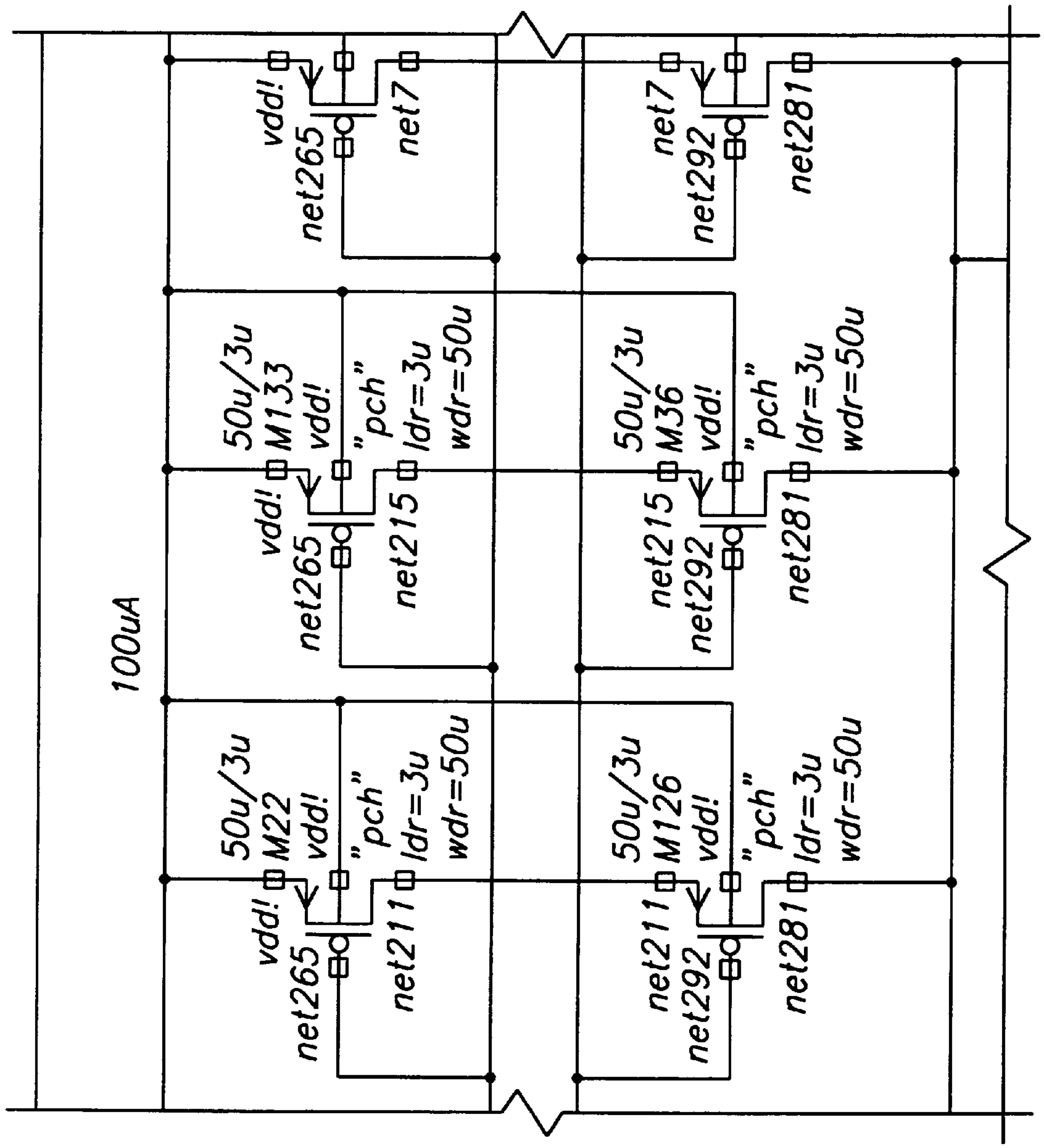
Fig. 9.07AG

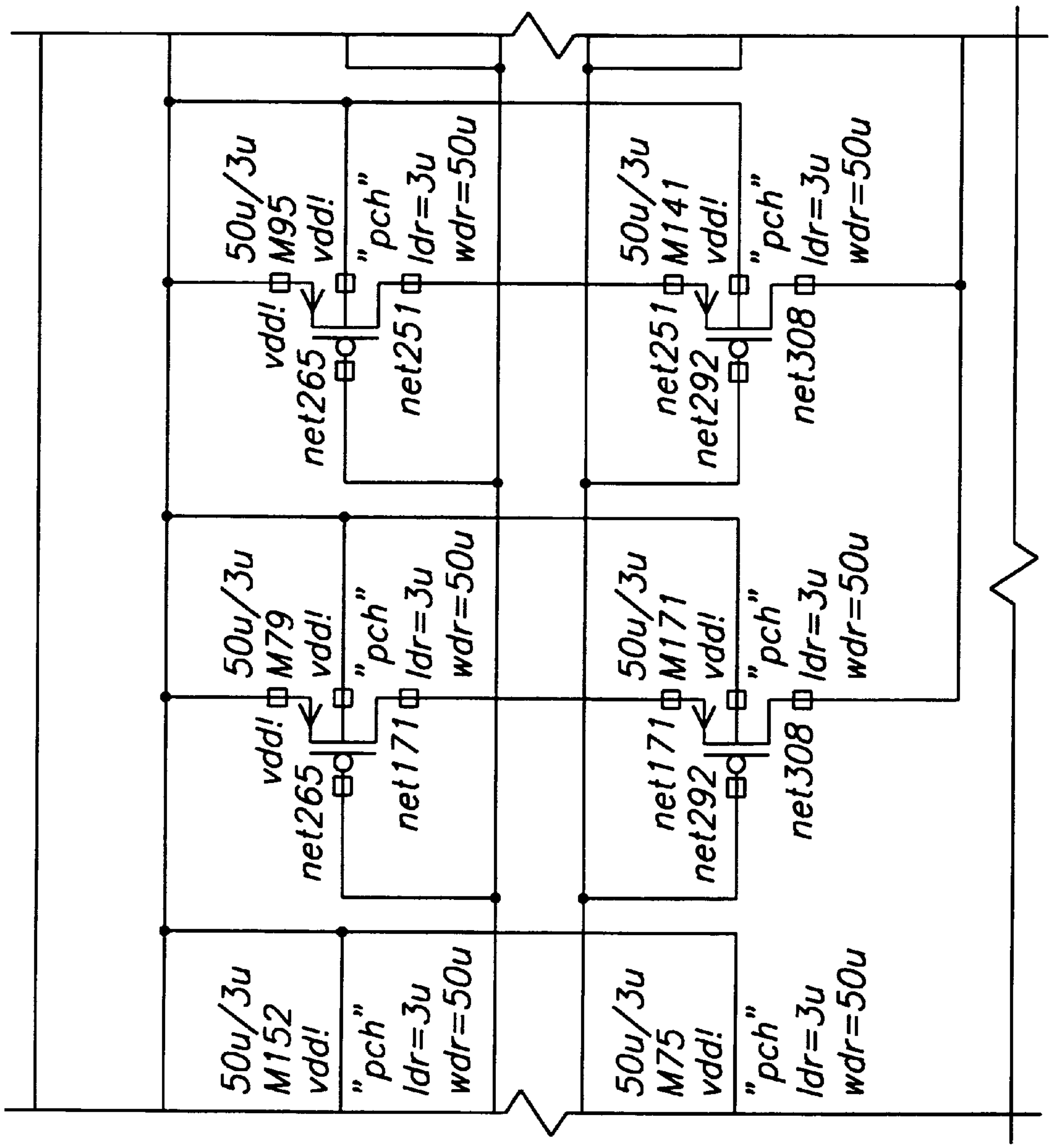
FIG. 9.07AH

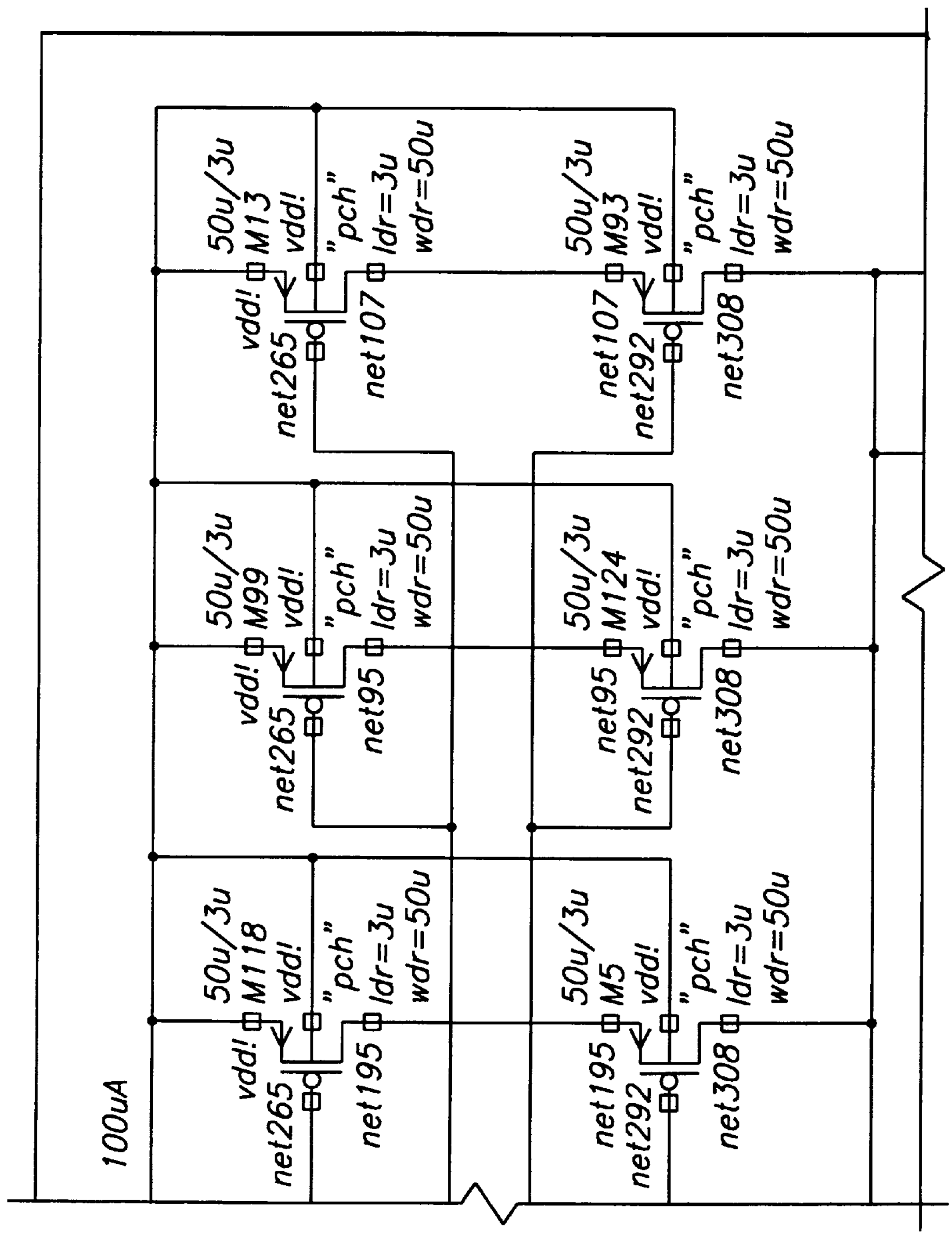
FIG. 9.07AI

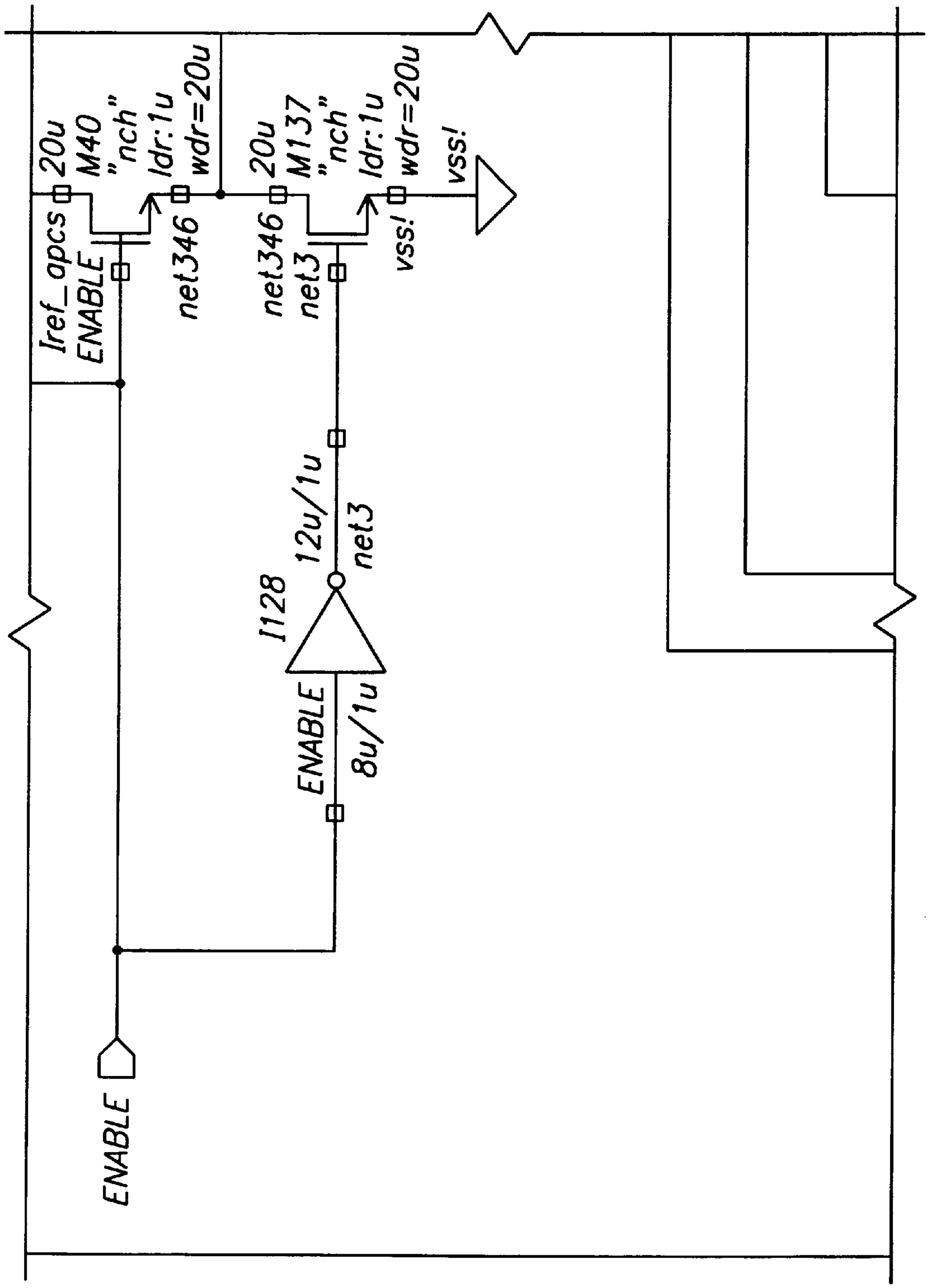
FIG. 9.07BA

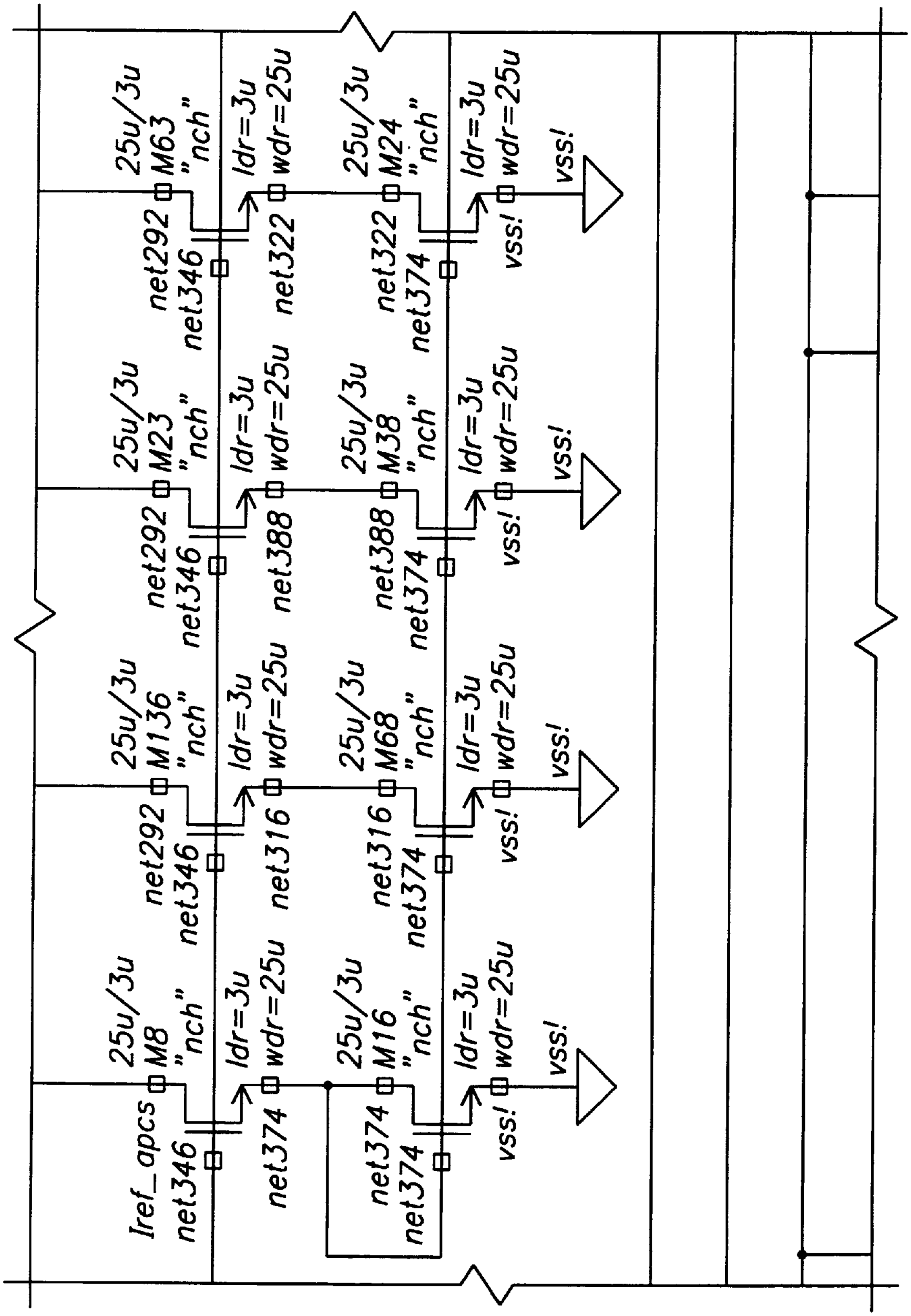
FIG. 9.07BB

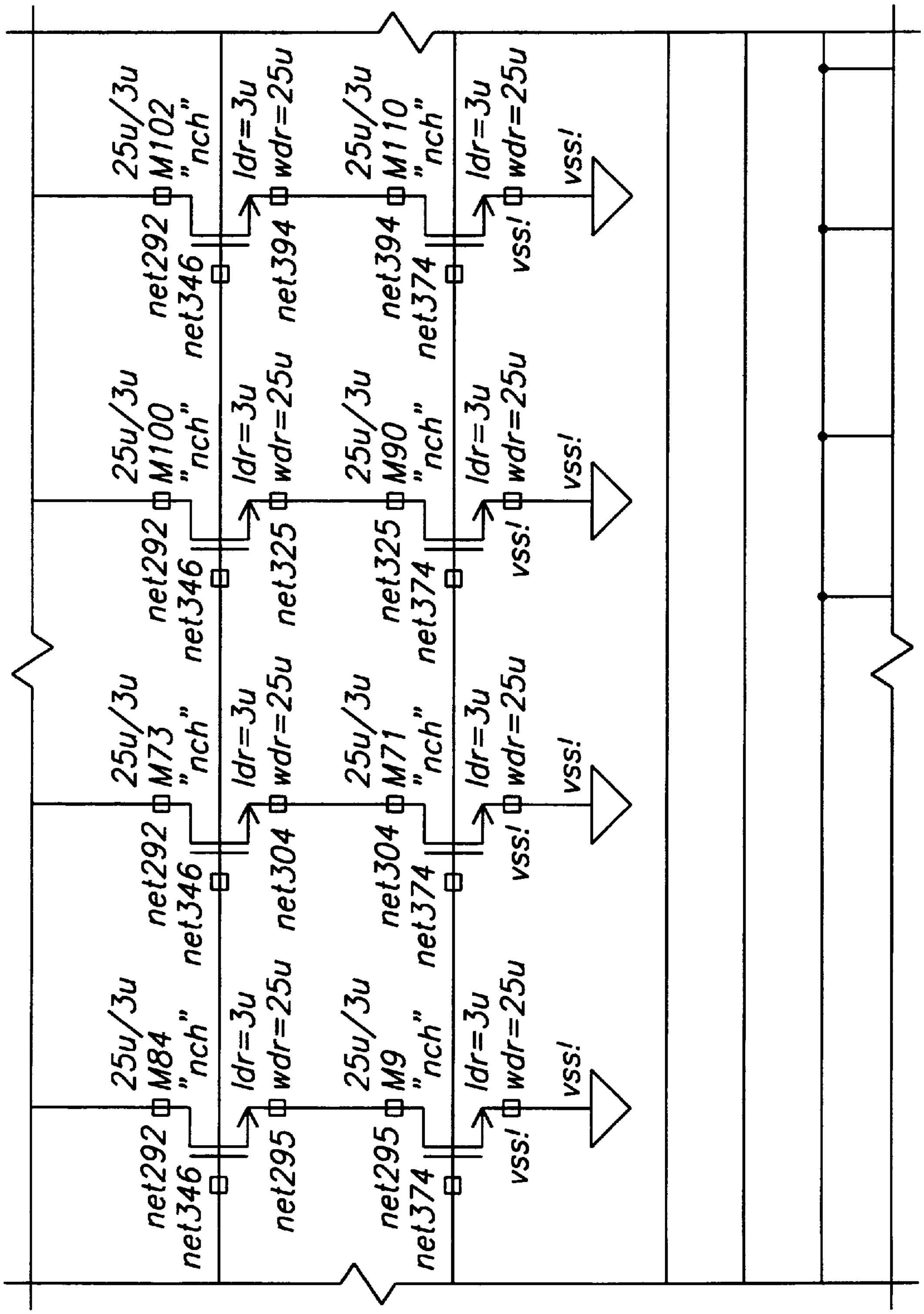
Fig. 9.07BC

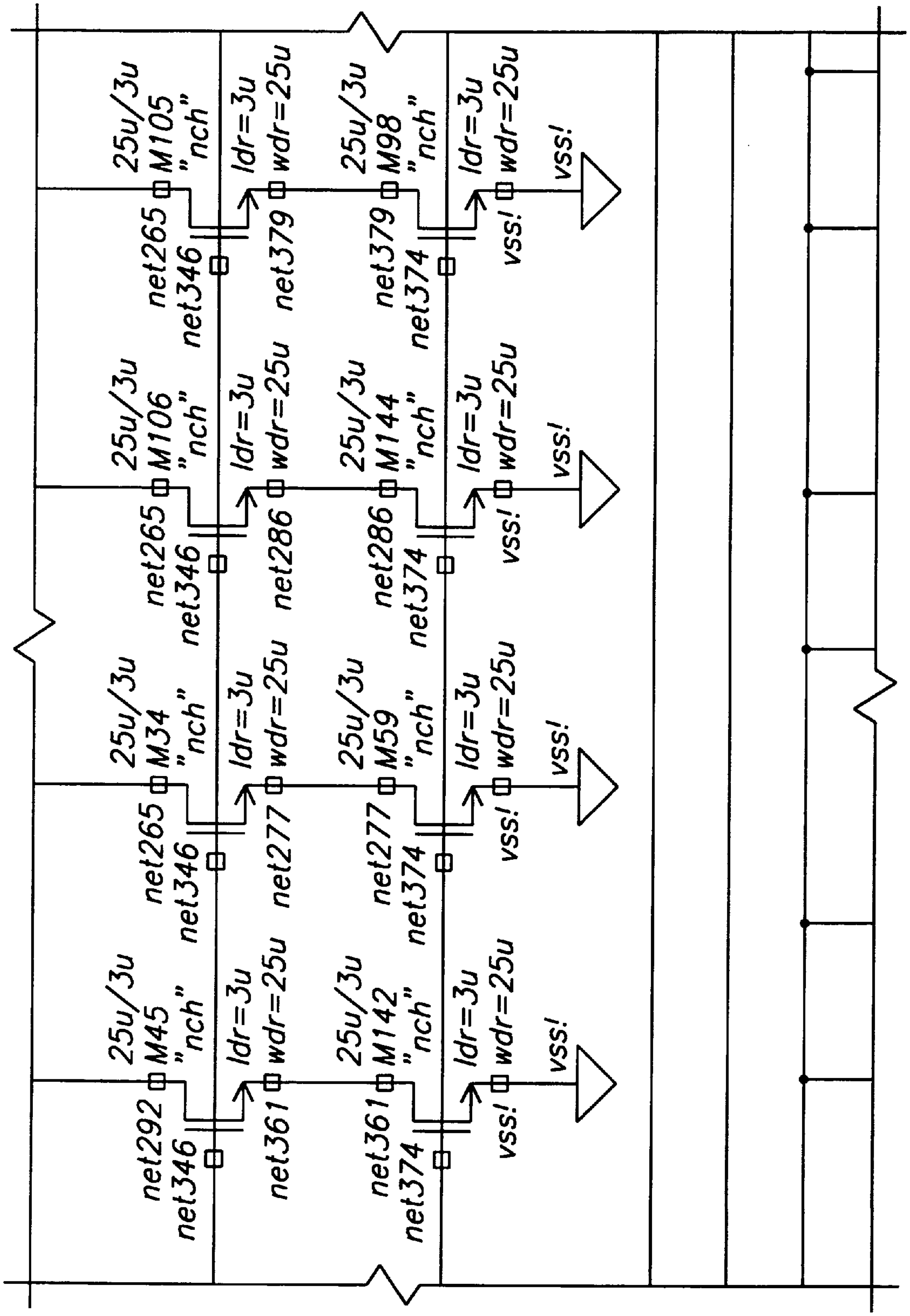
Fig. 9.07BD

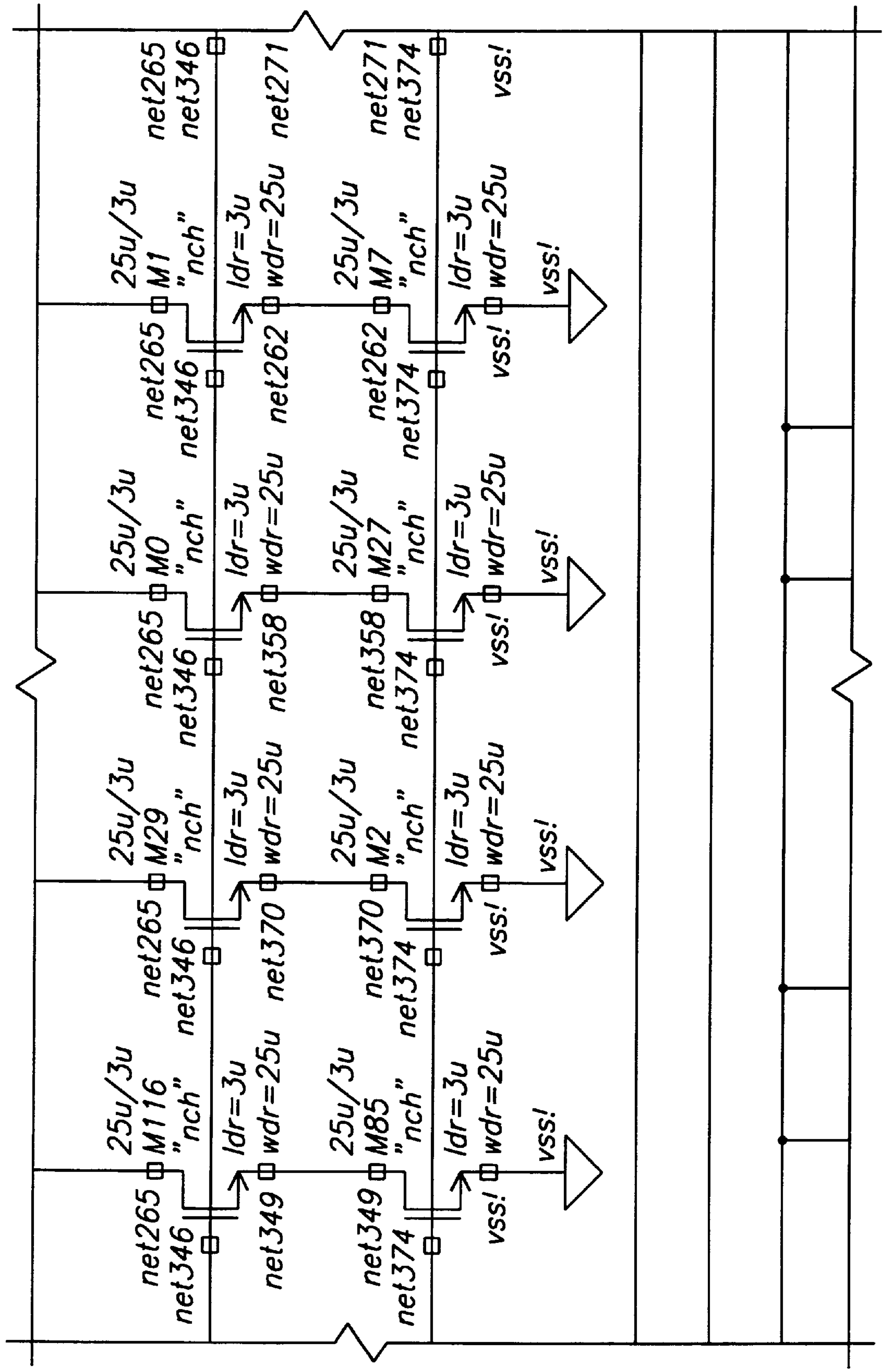
Fig. 9.071BE

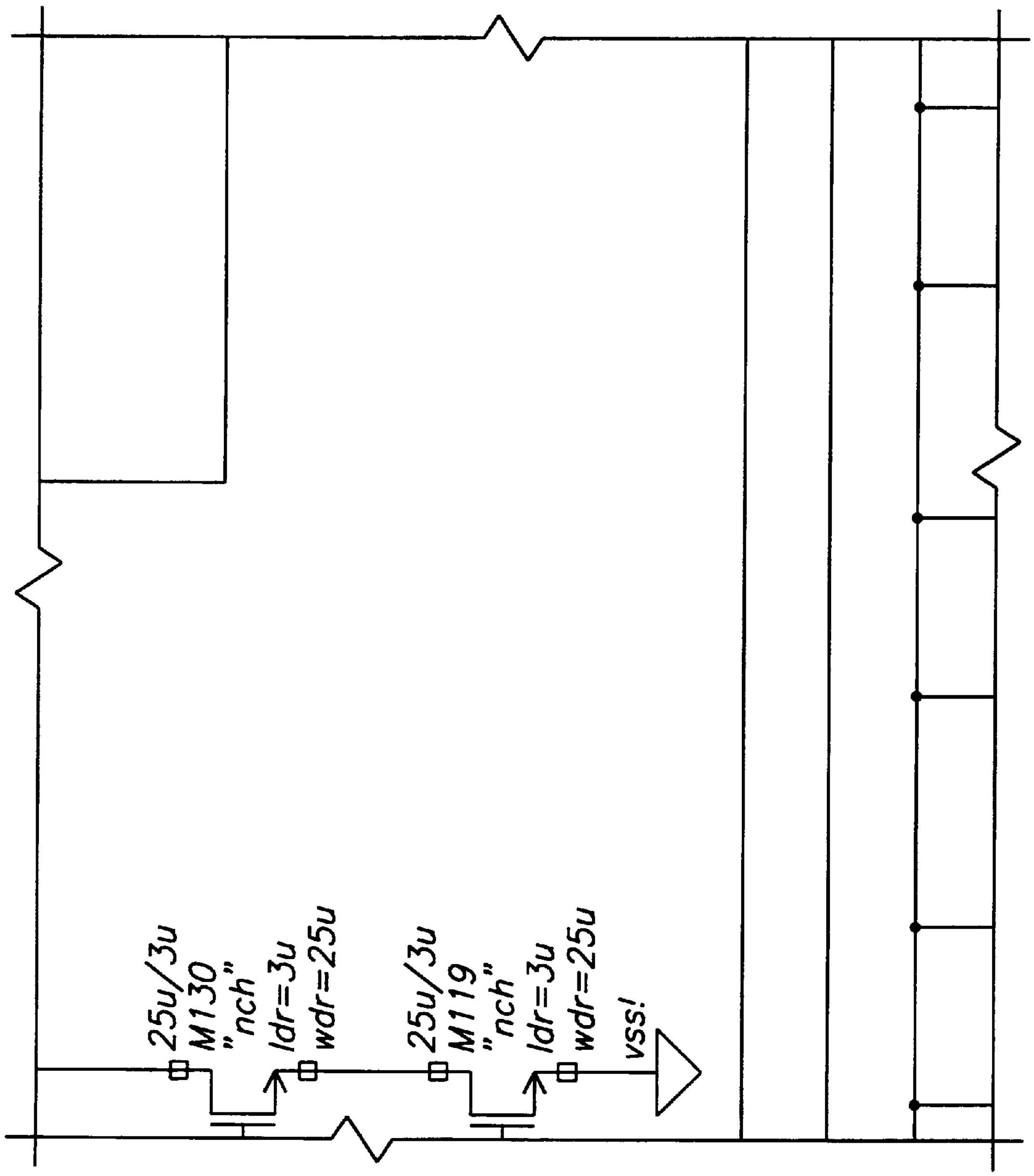
FIG. 9.07BF

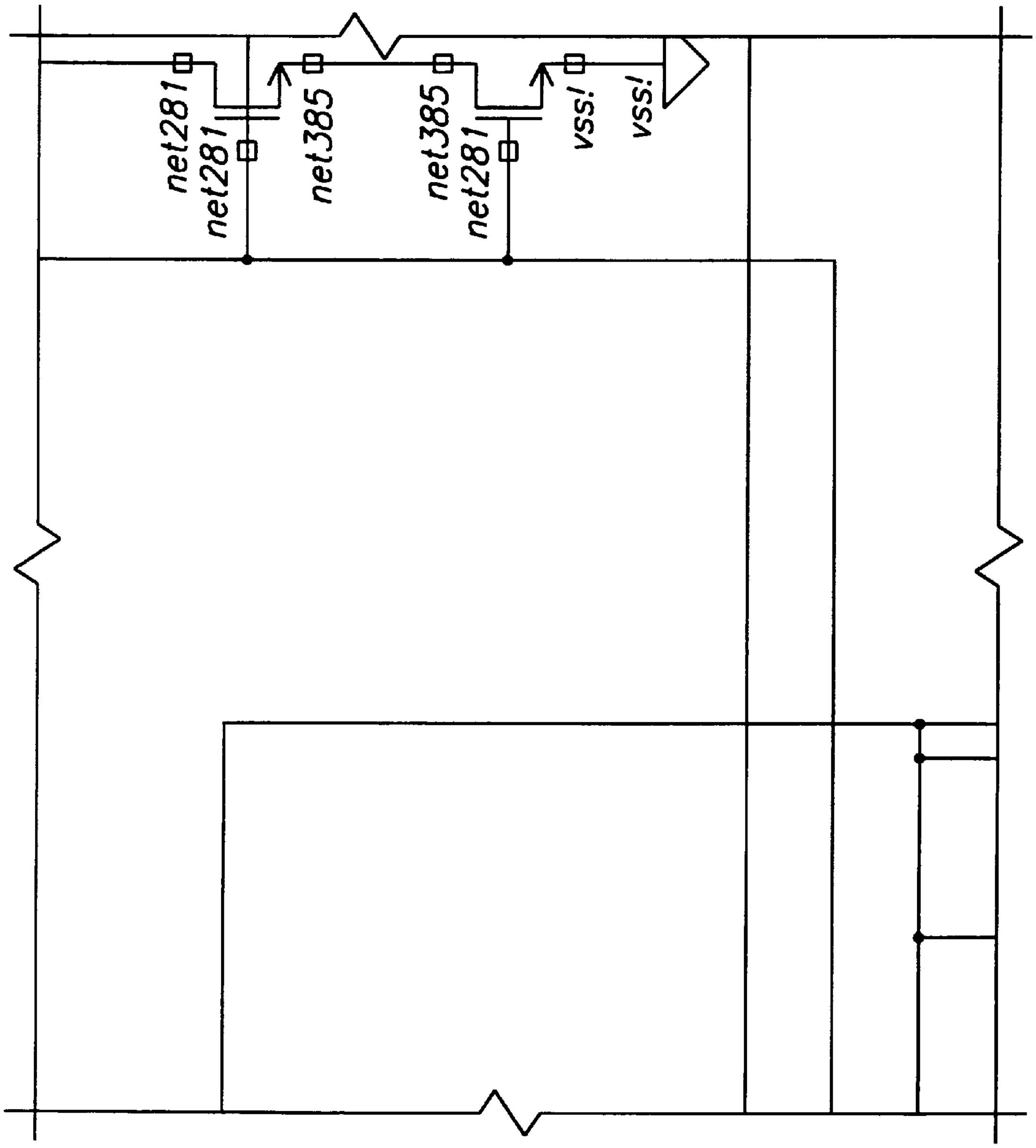
FIG. 9.07BG

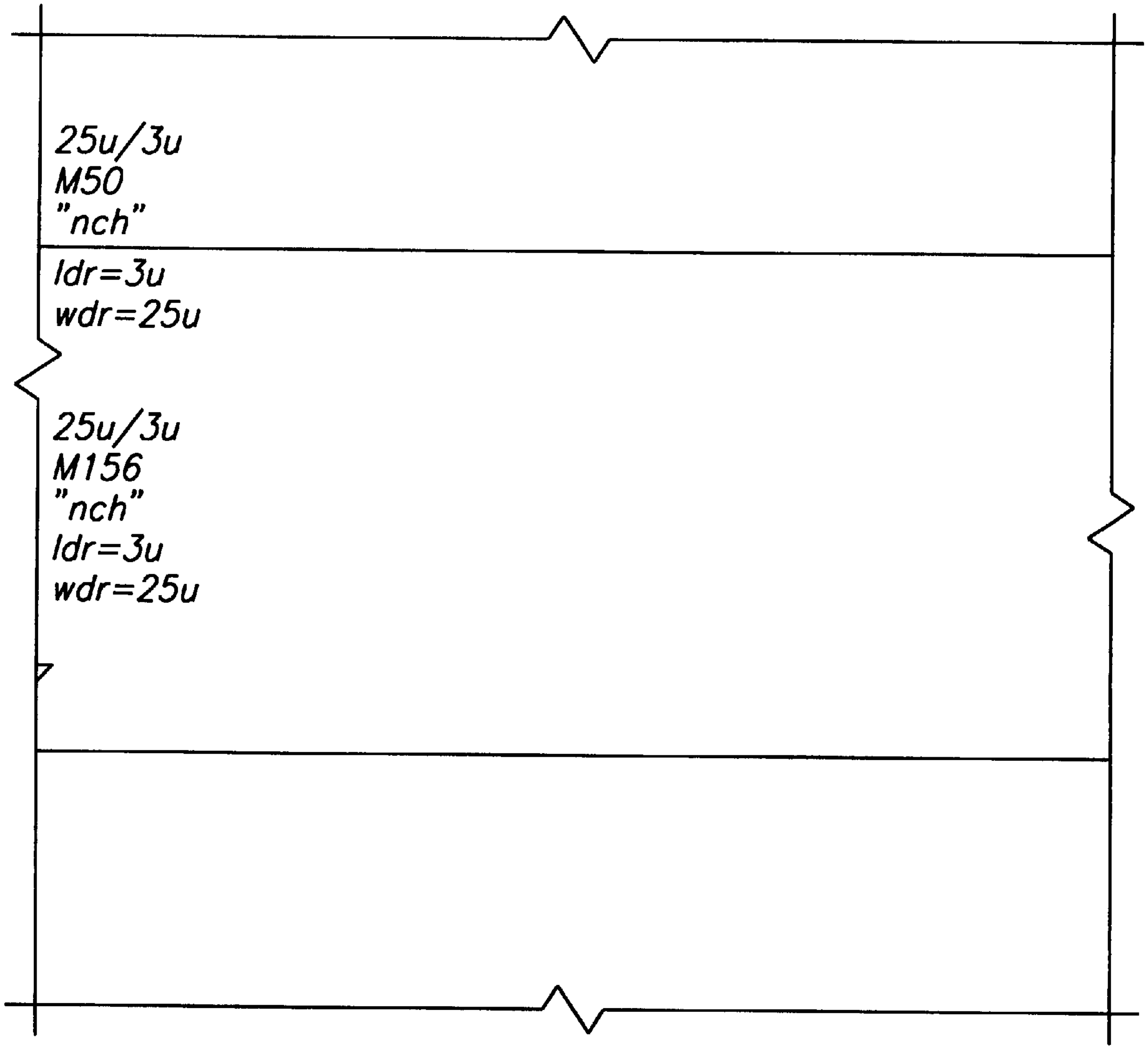
FIG. 9.07BH

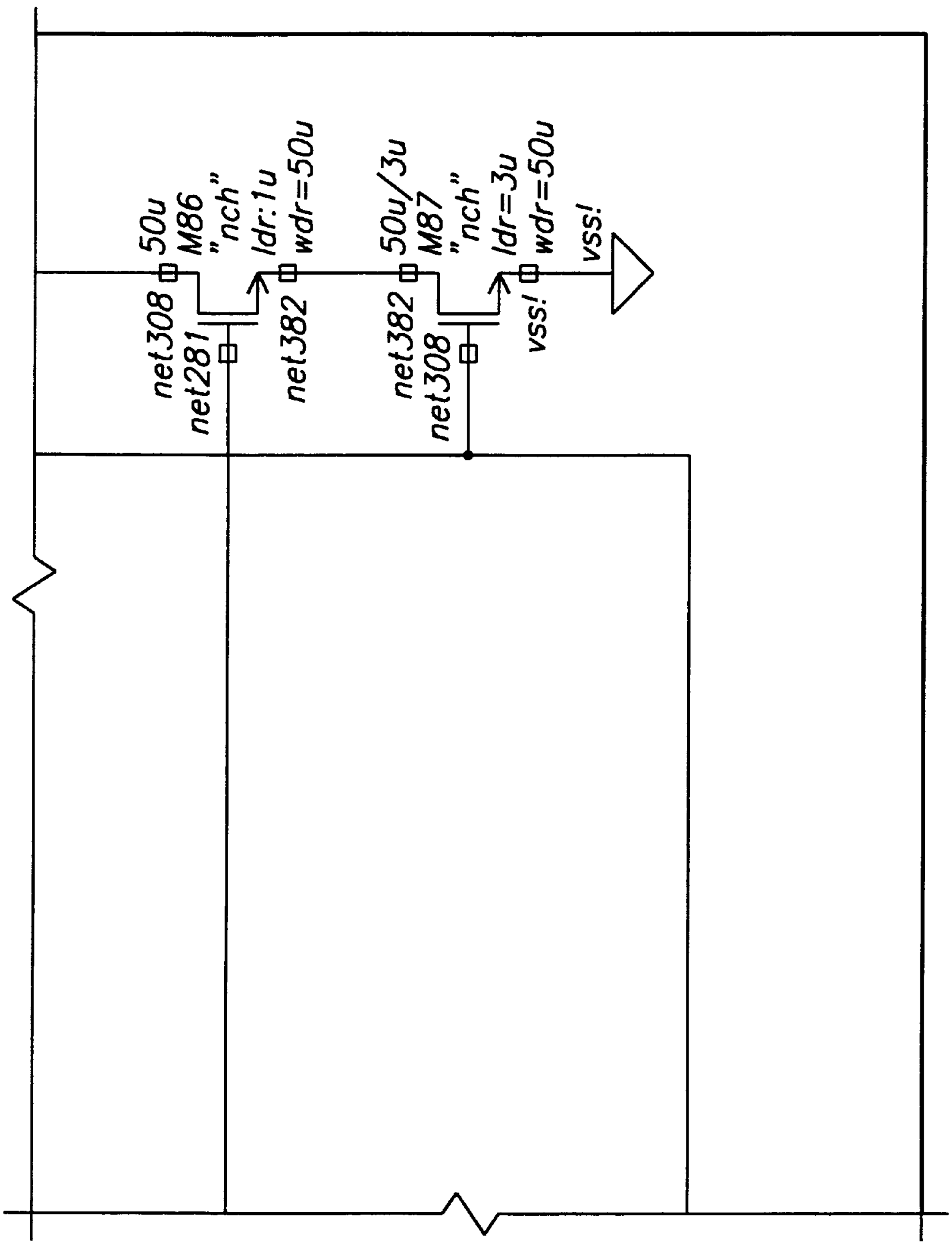
FIG. 9.07BI

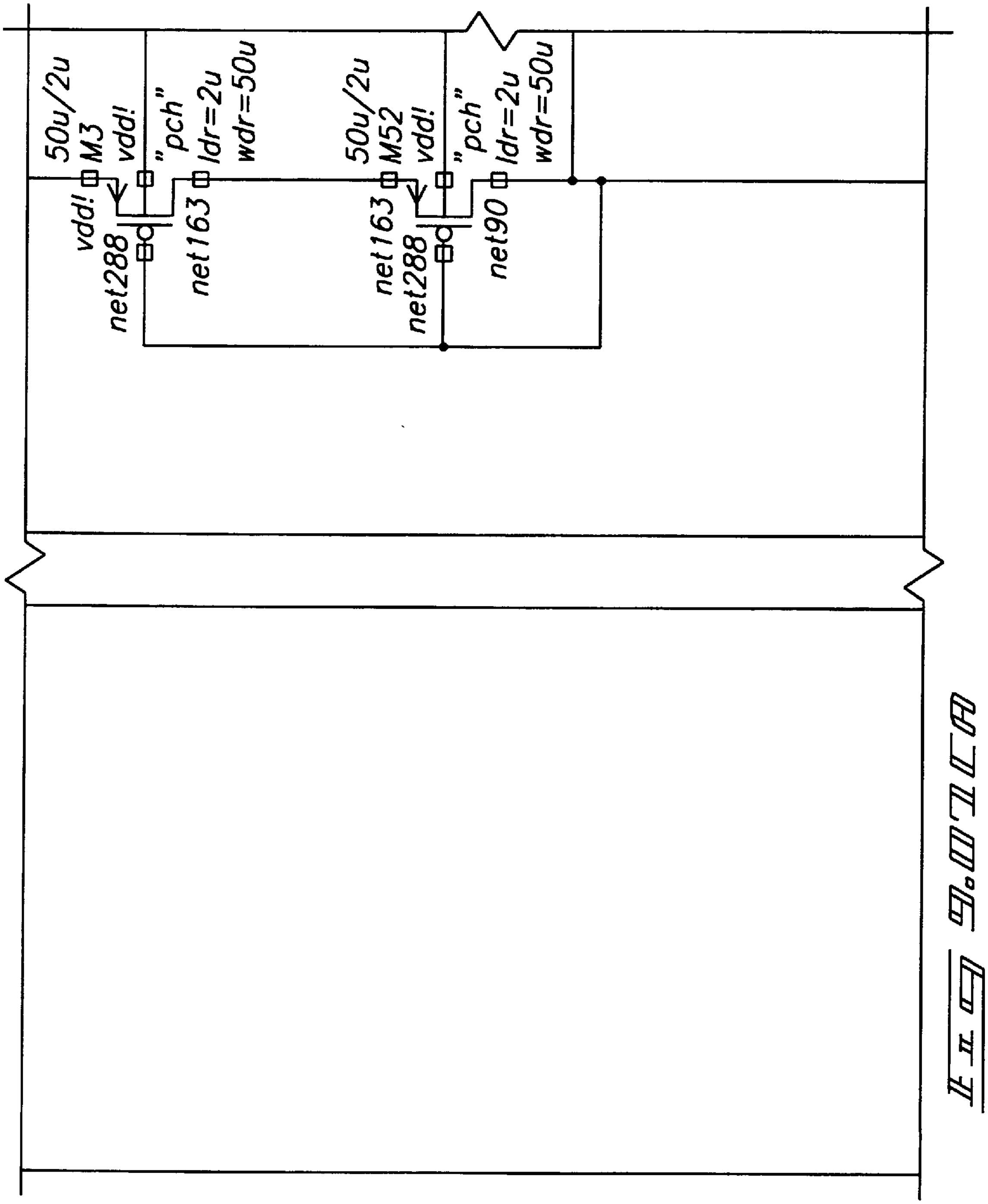
FIG. 9.07CA

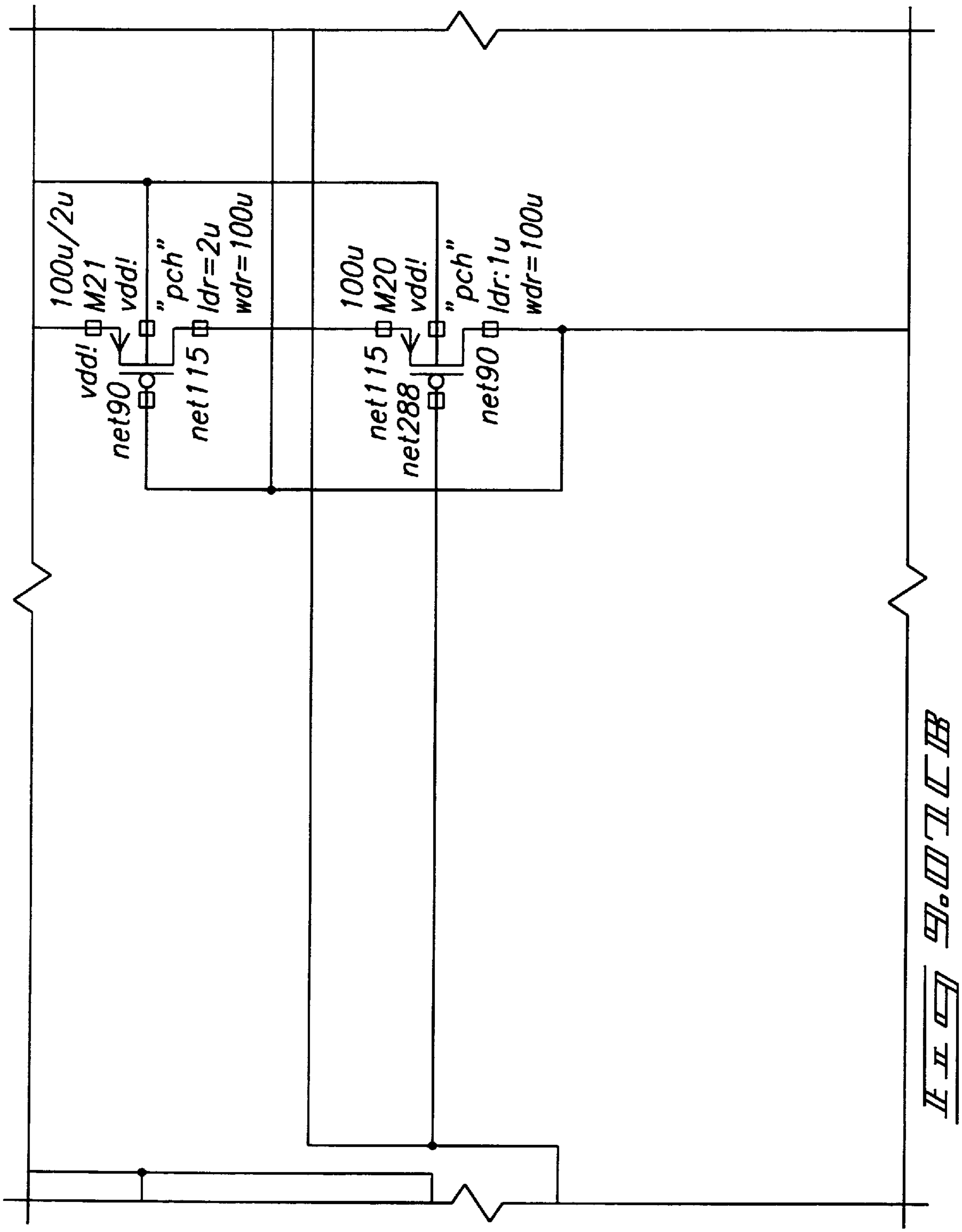
FIG. 9.07CB

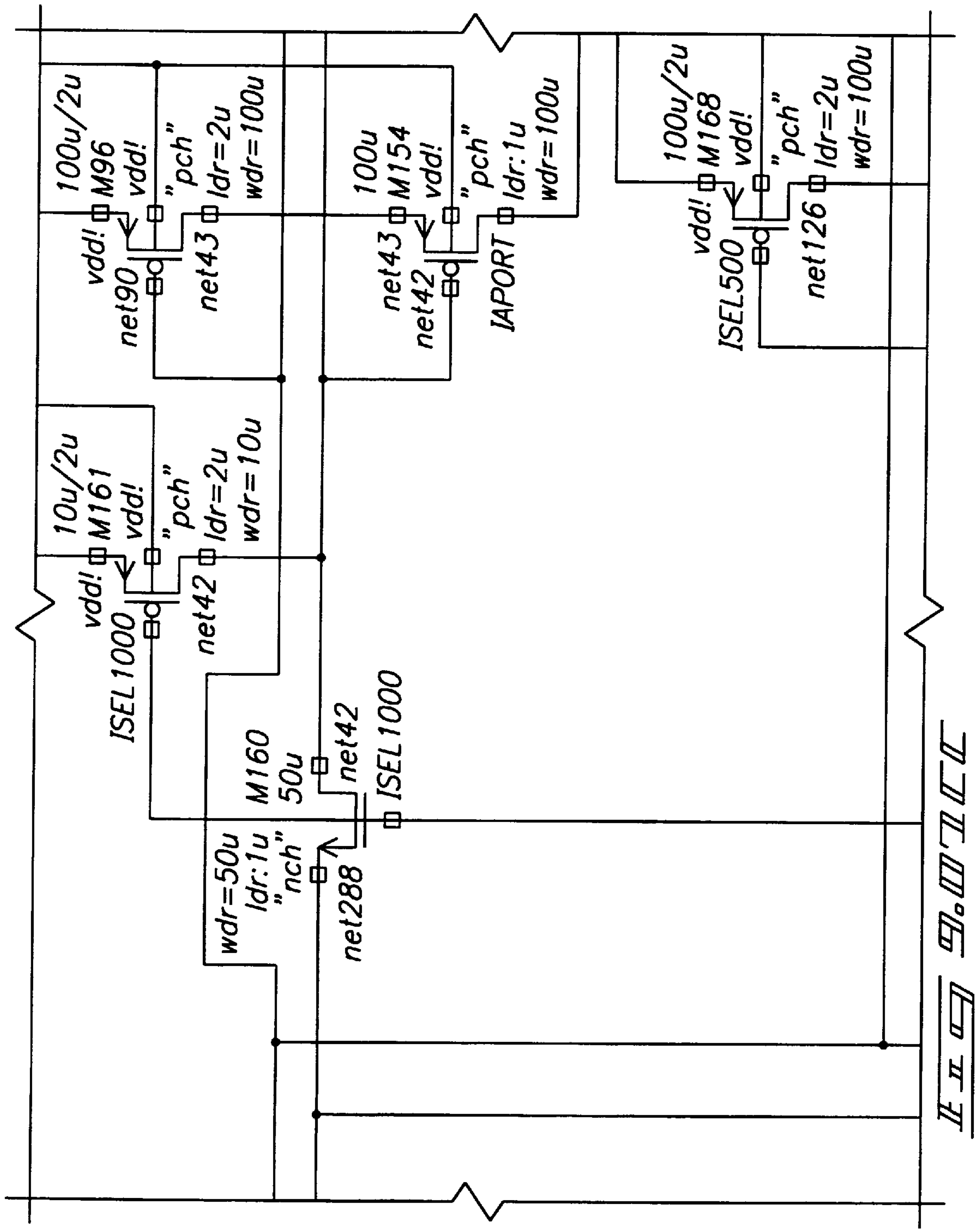
Fig. 9.07CC

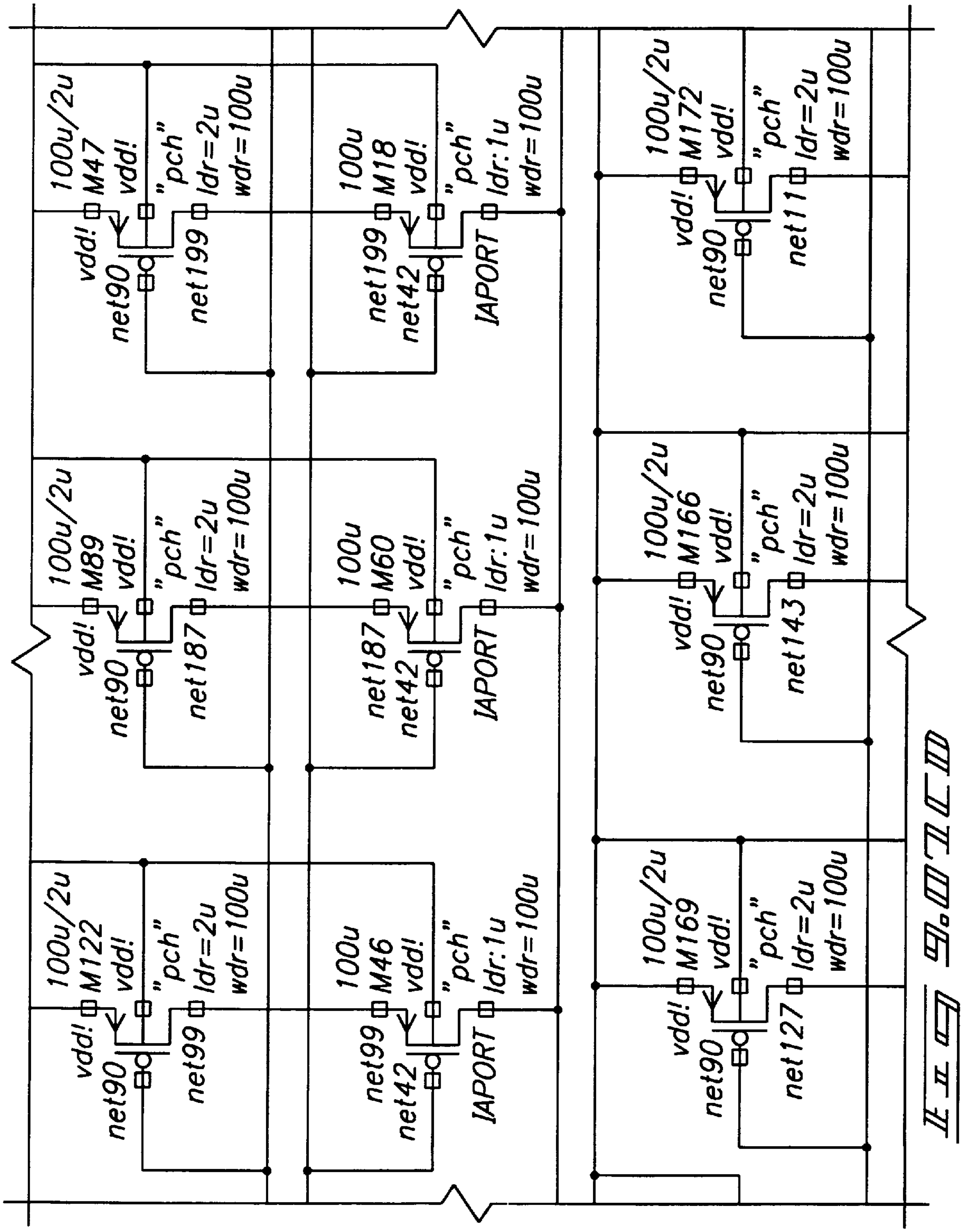
100u/2u
M47
vdd!
"pch"
ldr=2u
wdr=100u
net90
net199
100u
M18
ldr:1u
net42
IAPORT
M89
net187
M60
M122
net99
M46
M172
net11
M166
net143
M169
net127

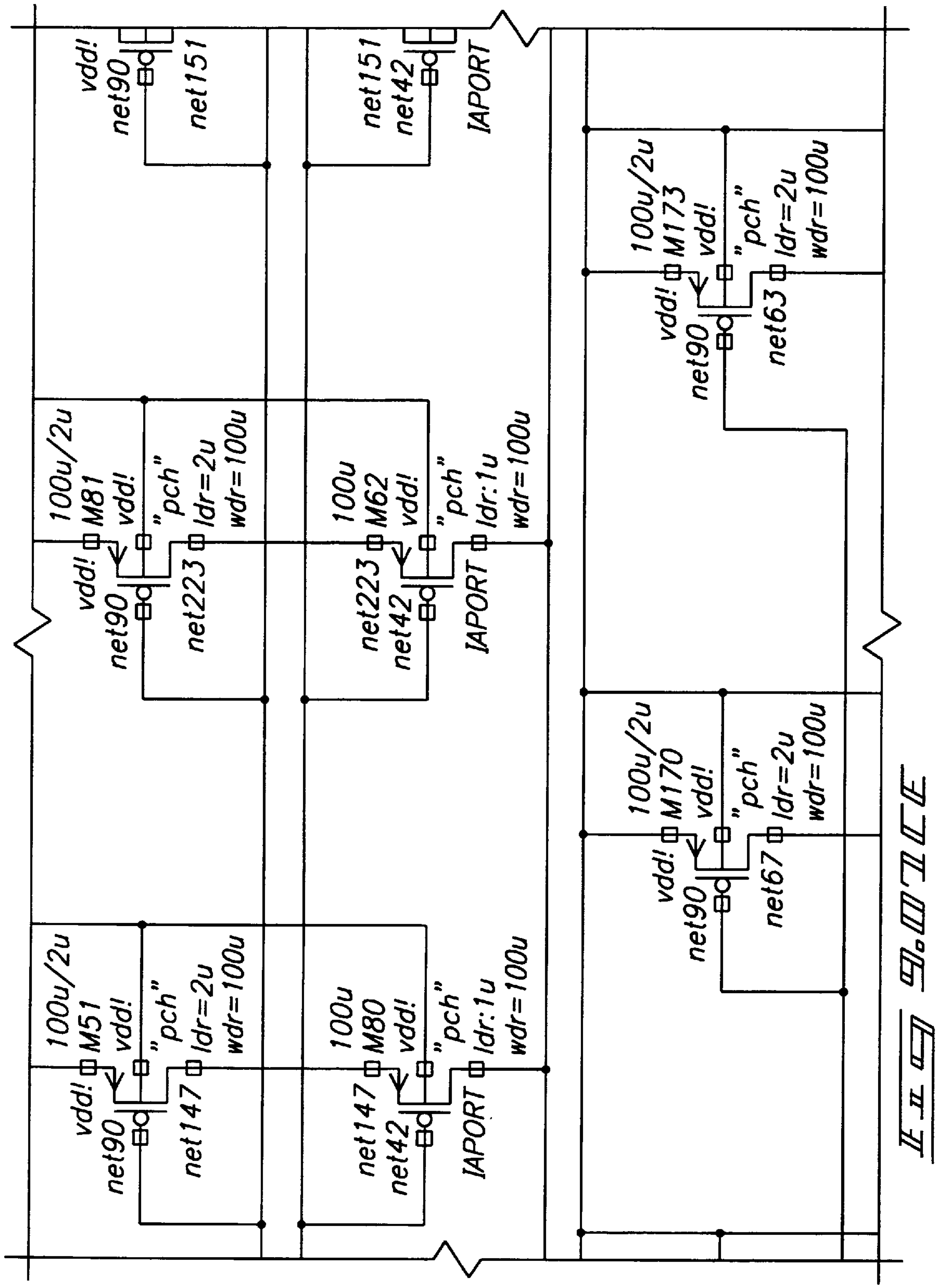
FIG. 9.07CE

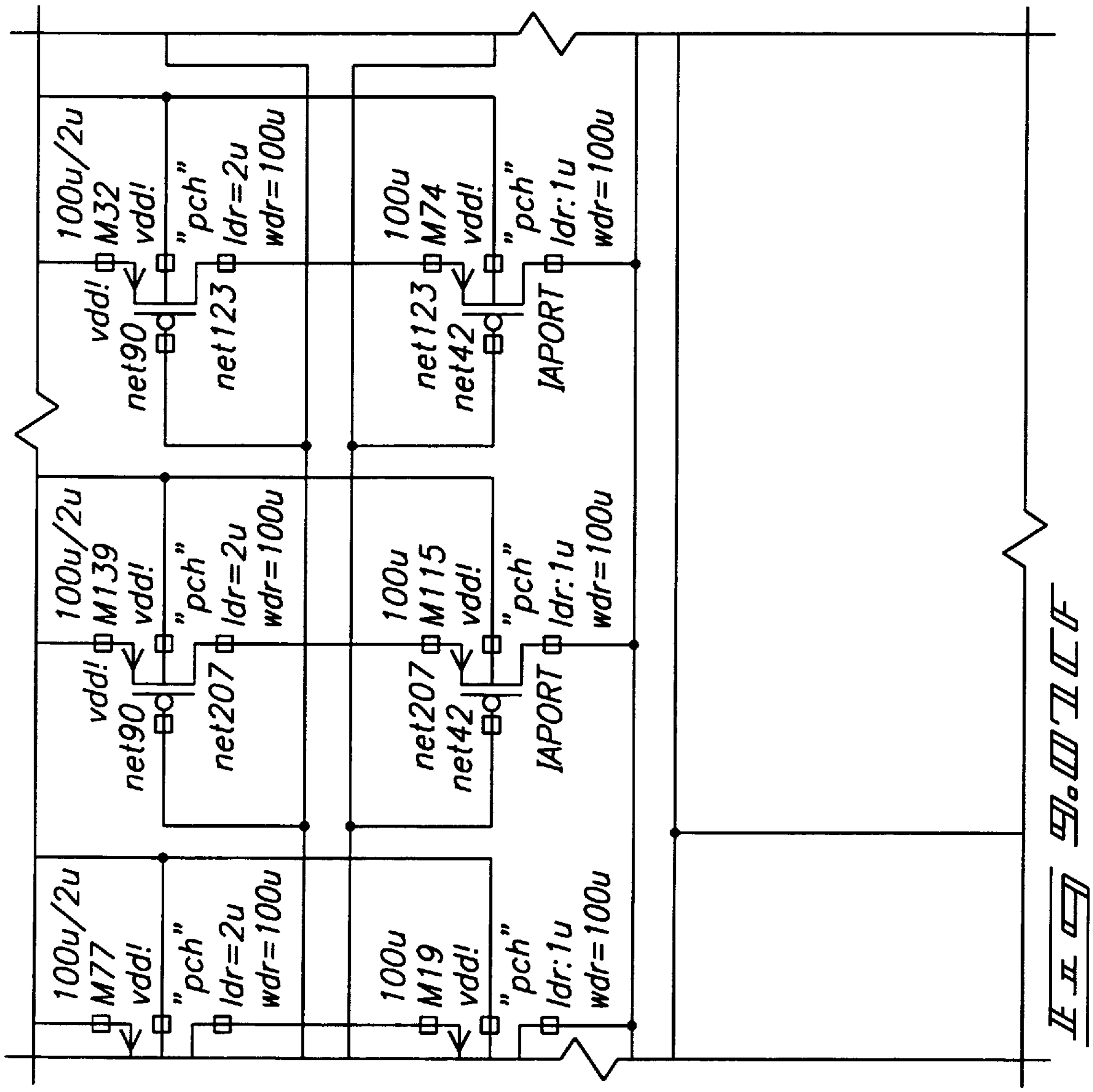
FIG. 9.07CF

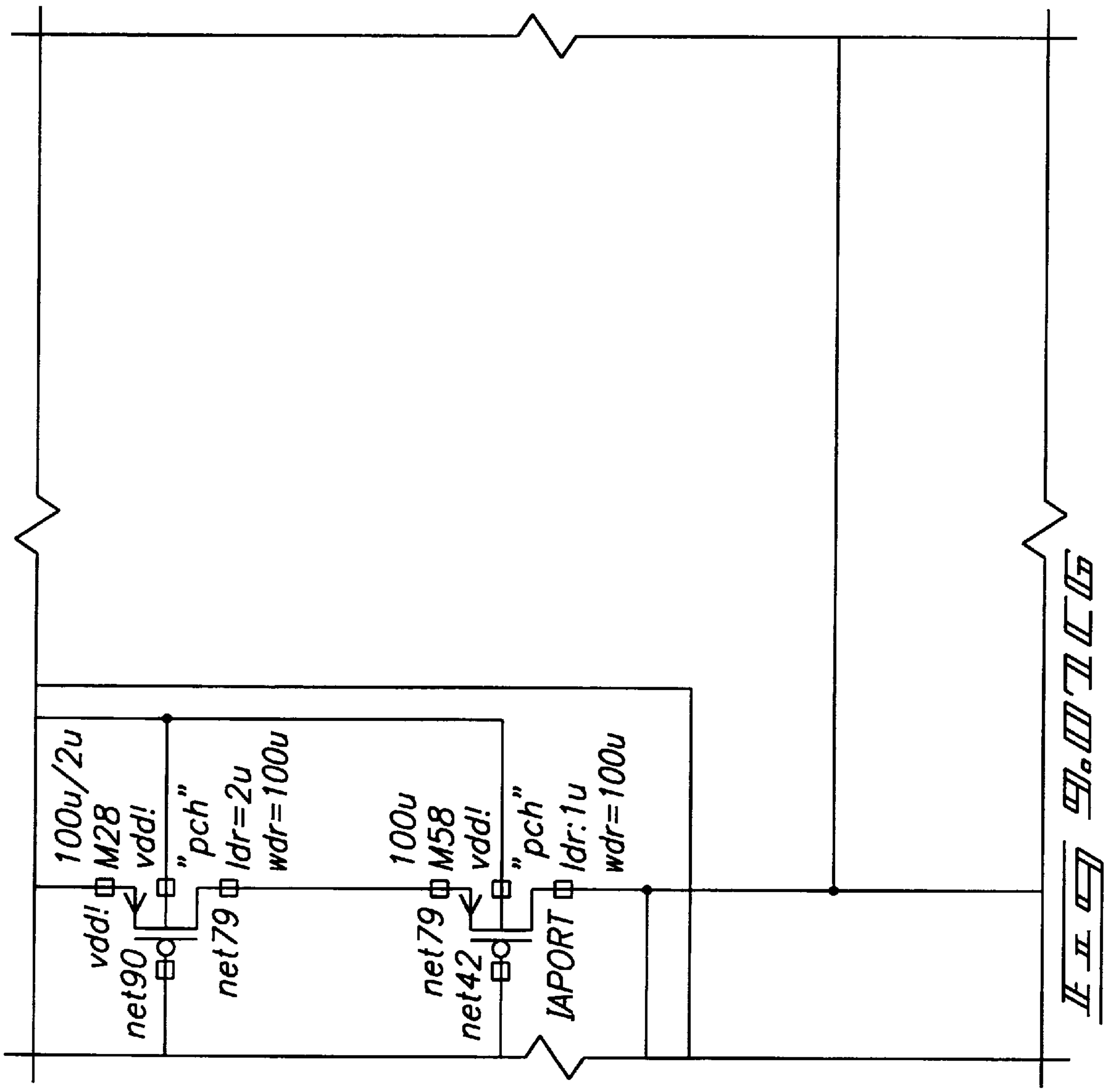
FIG. 9.07G

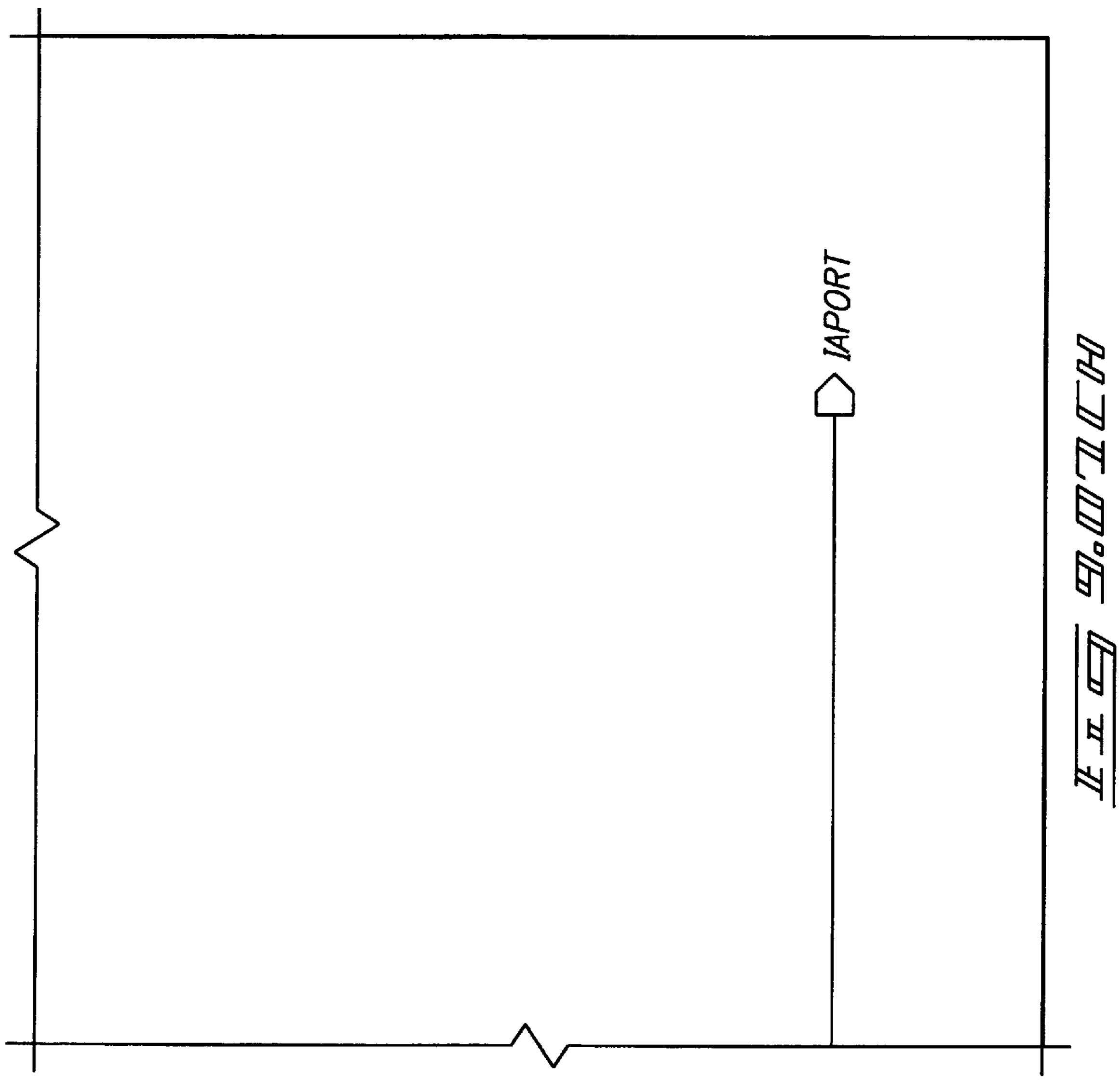
Fig. 9.07CH

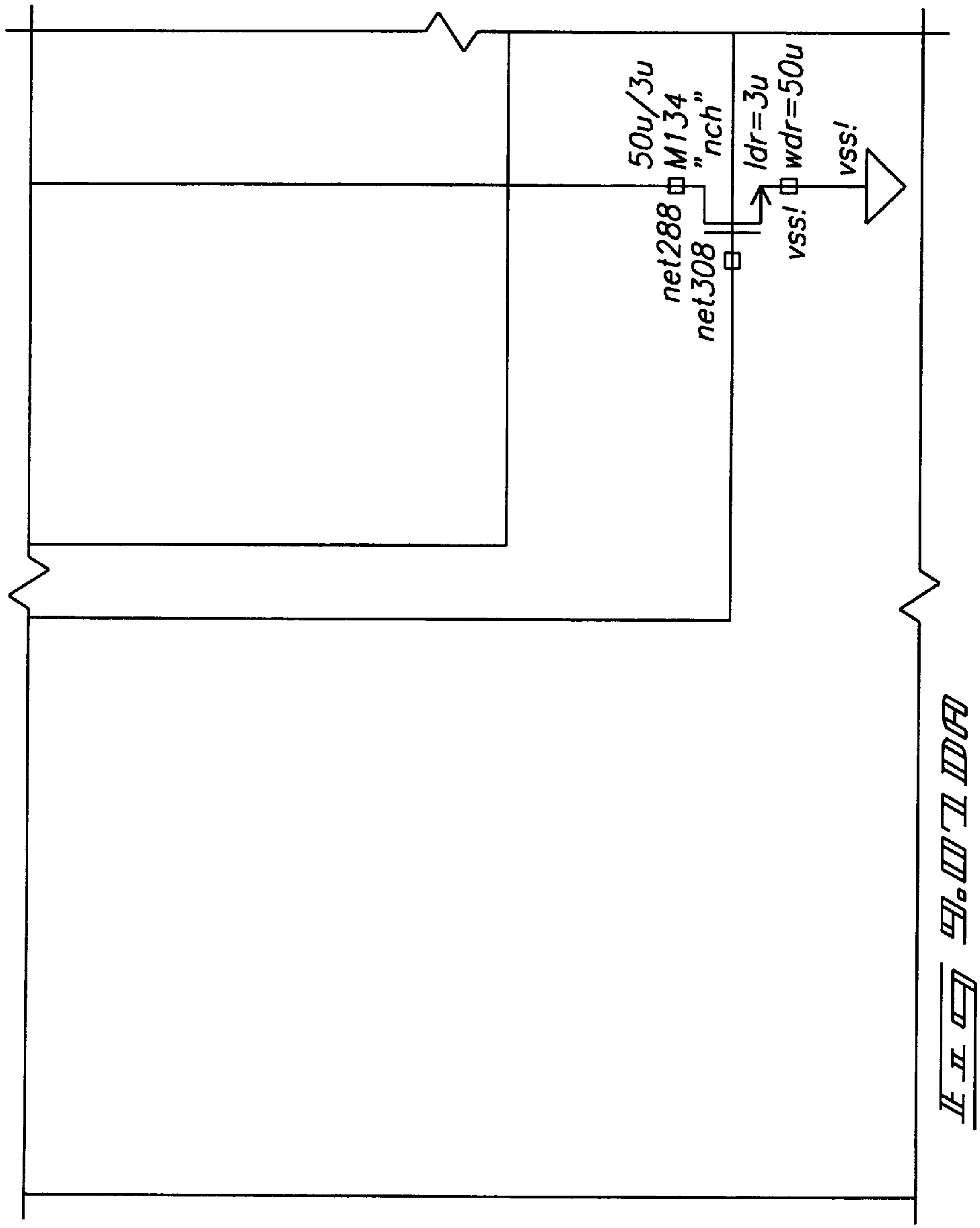
FIG. 9.07.10A

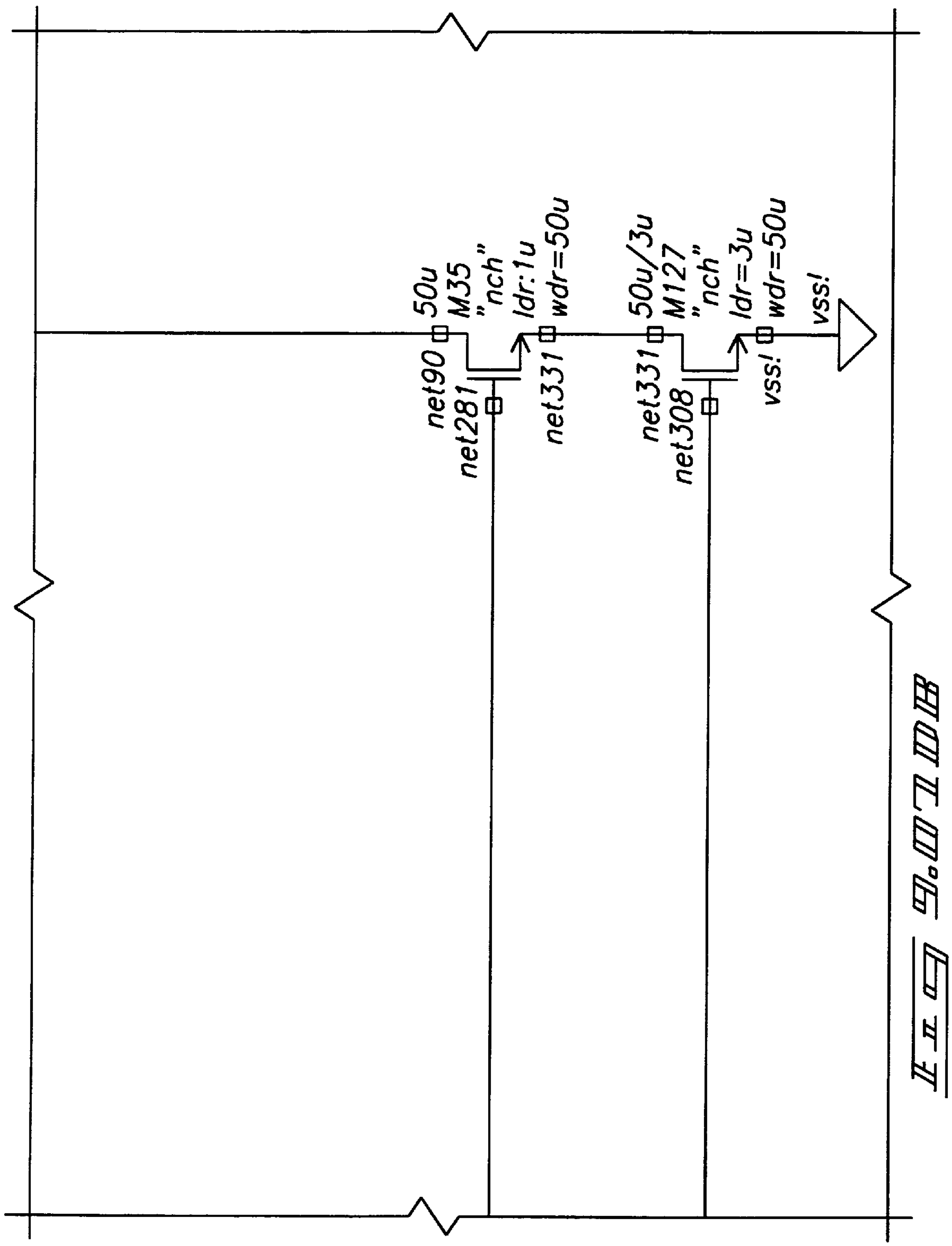
FIG. 9.07DB

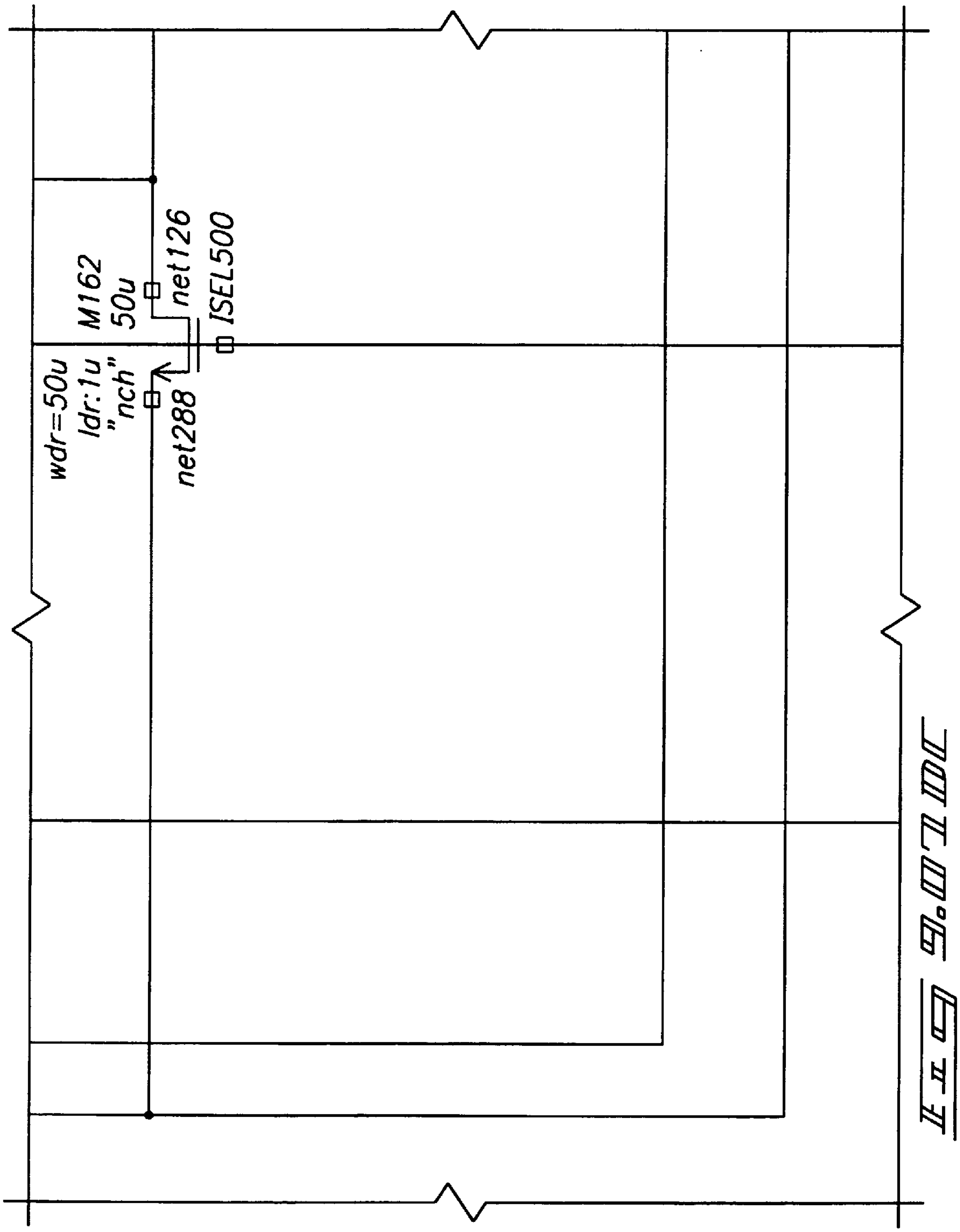
FIG. 9.070C

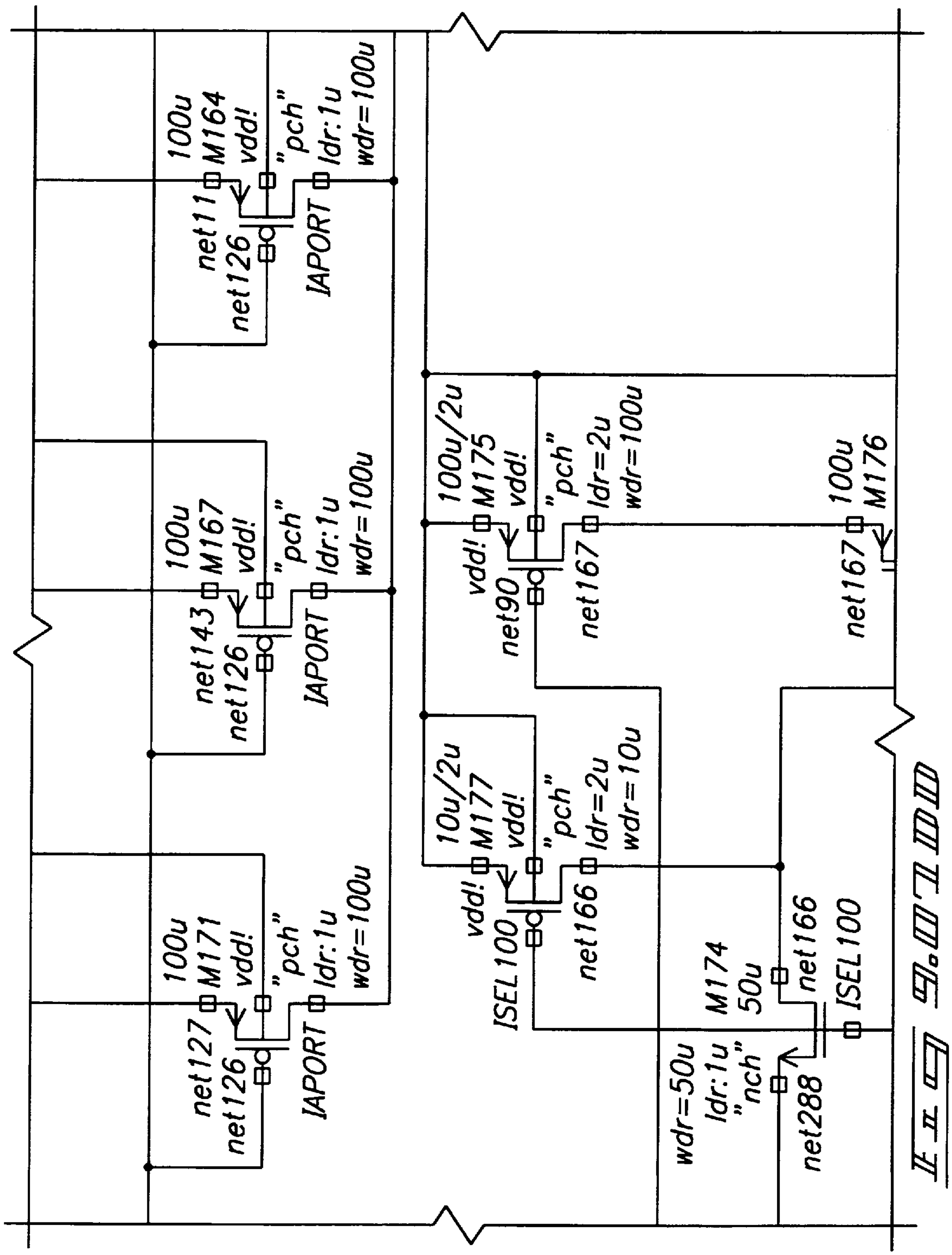
100u
M164
vdd!
"pch"
ldr:1u
wdr=100u
net11
net126
IAPORT
100u
M167
vdd!
"pch"
ldr:1u
wdr=100u
net143
net126
IAPORT
100u
M171
vdd!
"pch"
ldr:1u
wdr=100u
net127
net126
IAPORT
100u/2u
M175
vdd!
"pch"
ldr=2u
wdr=100u
vdd!
net90
net167
100u
M176
net167
10u/2u
M177
vdd!
"pch"
ldr=2u
wdr=10u
vdd!
ISEL100
net166
M174
50u
net166
ISEL100
wdr=50u
ldr:1u
"nch"
net288

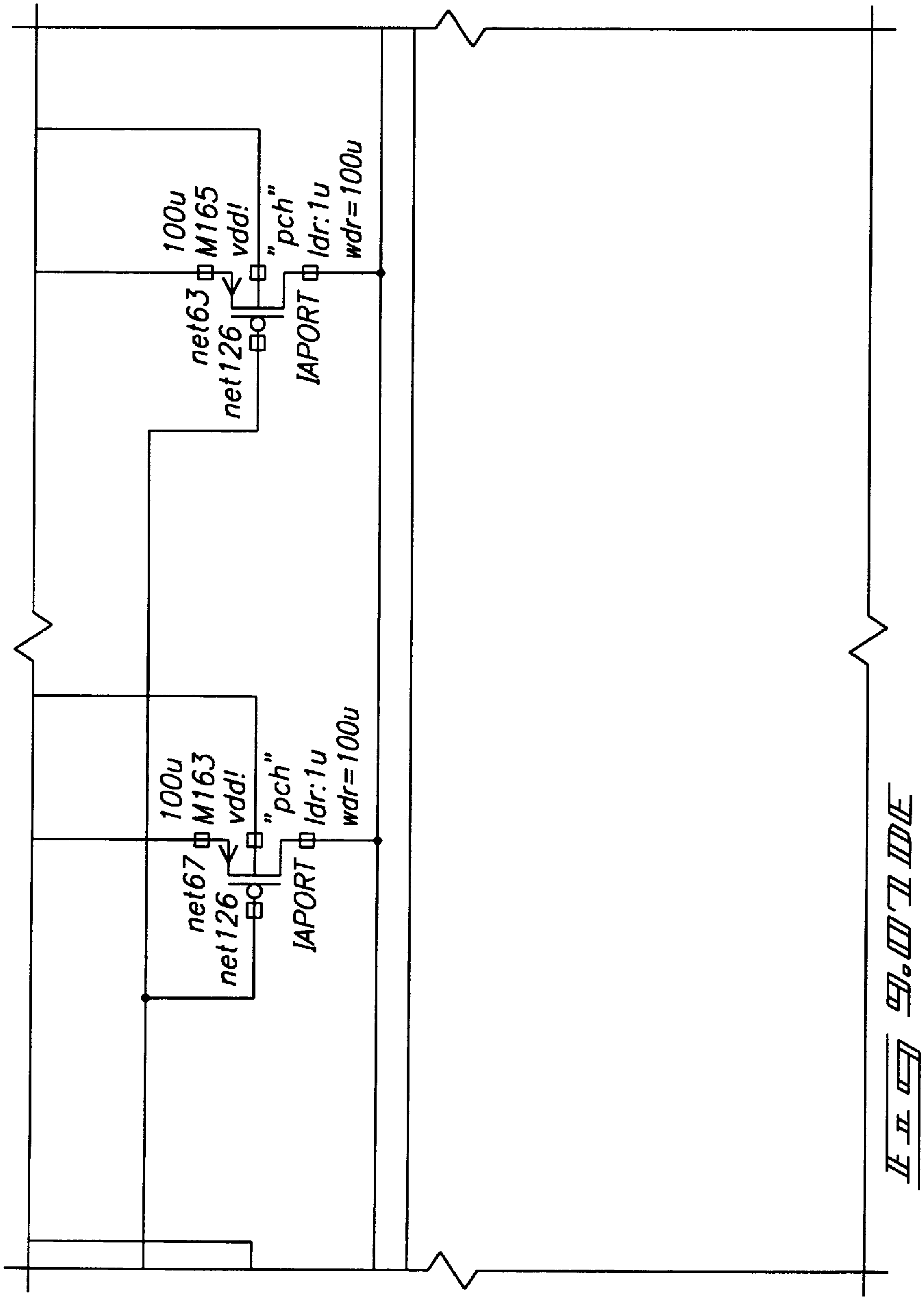
FIG. 9.07DE

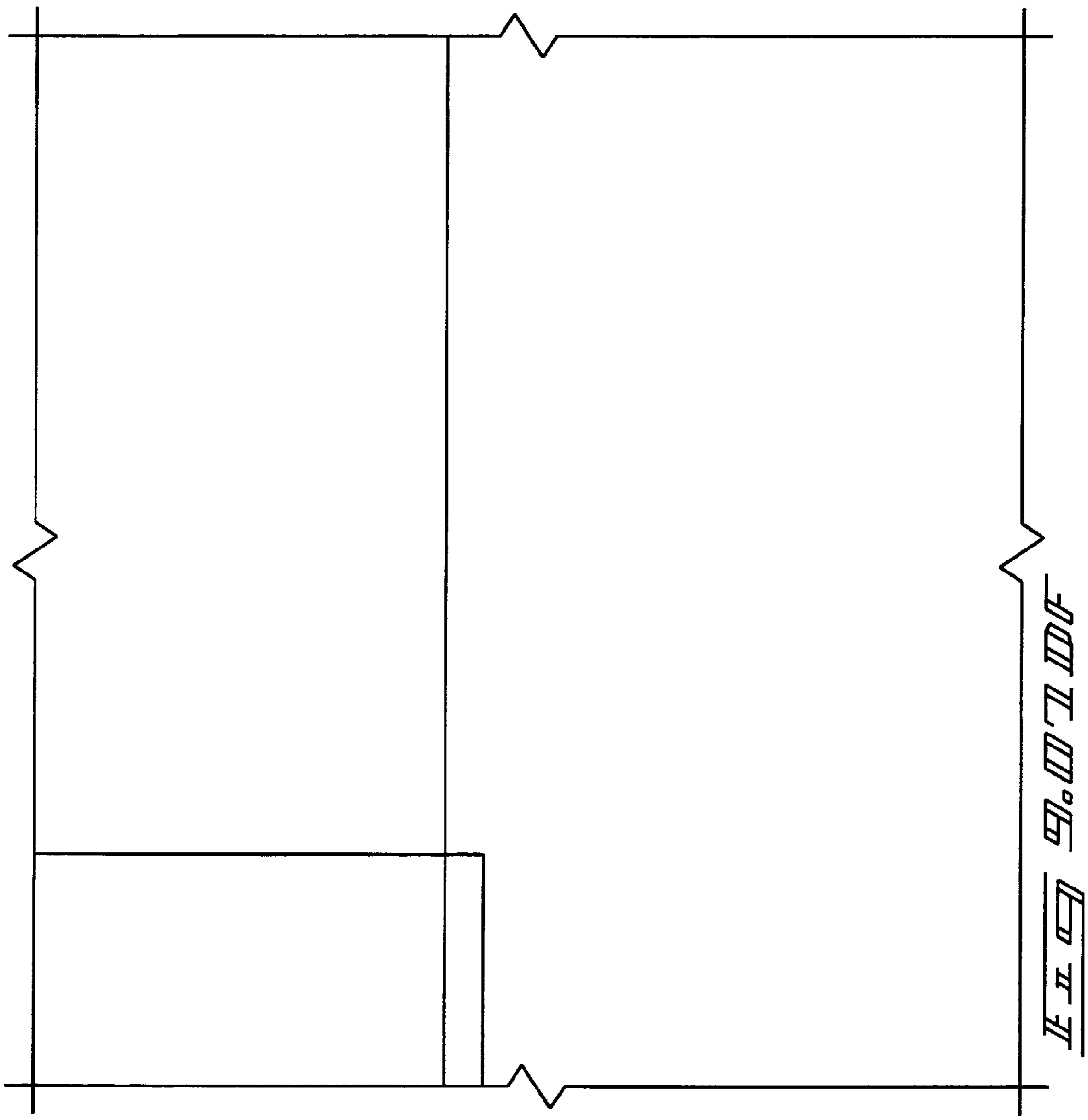
Fig. 9.07DF

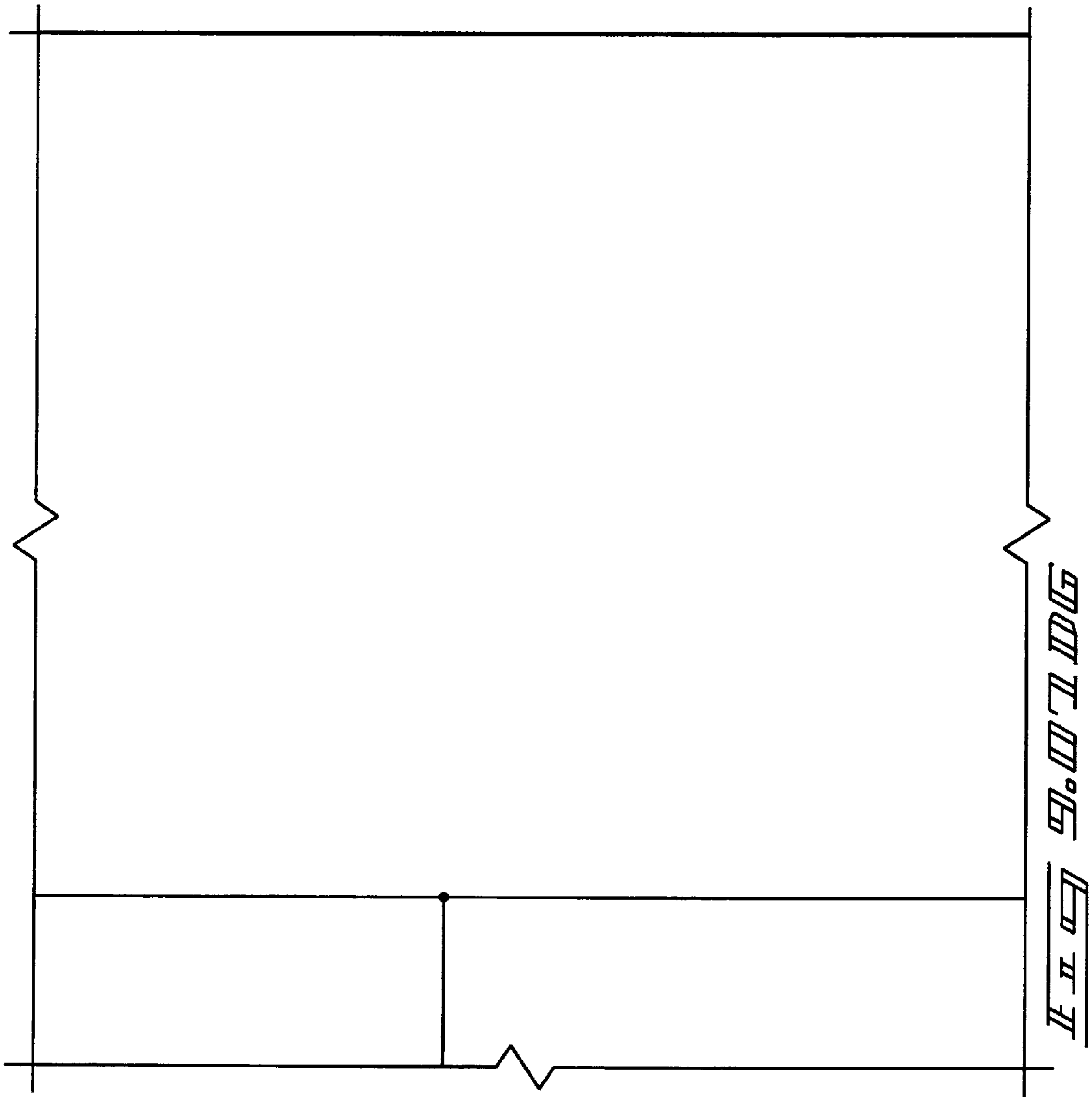
FIG. 9.07DG

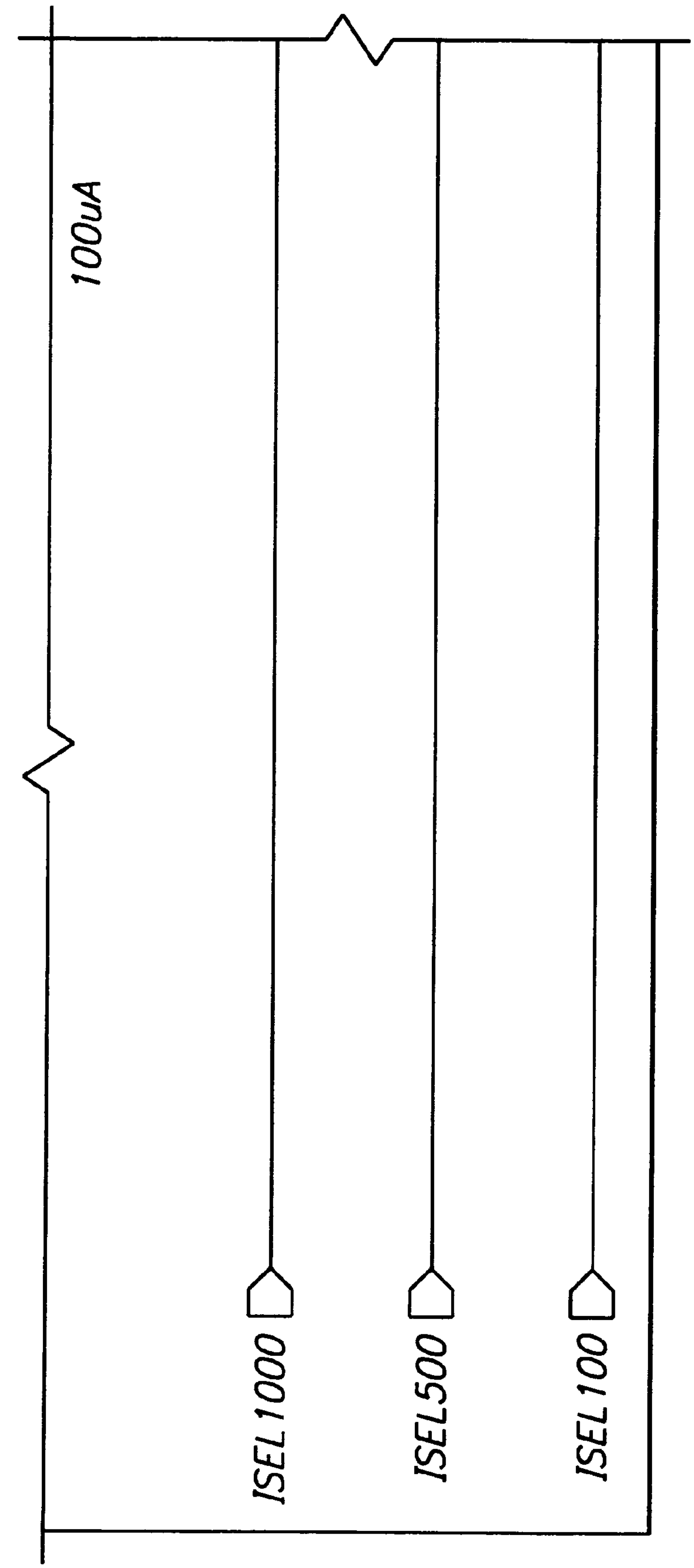
Fig. 9.07EA

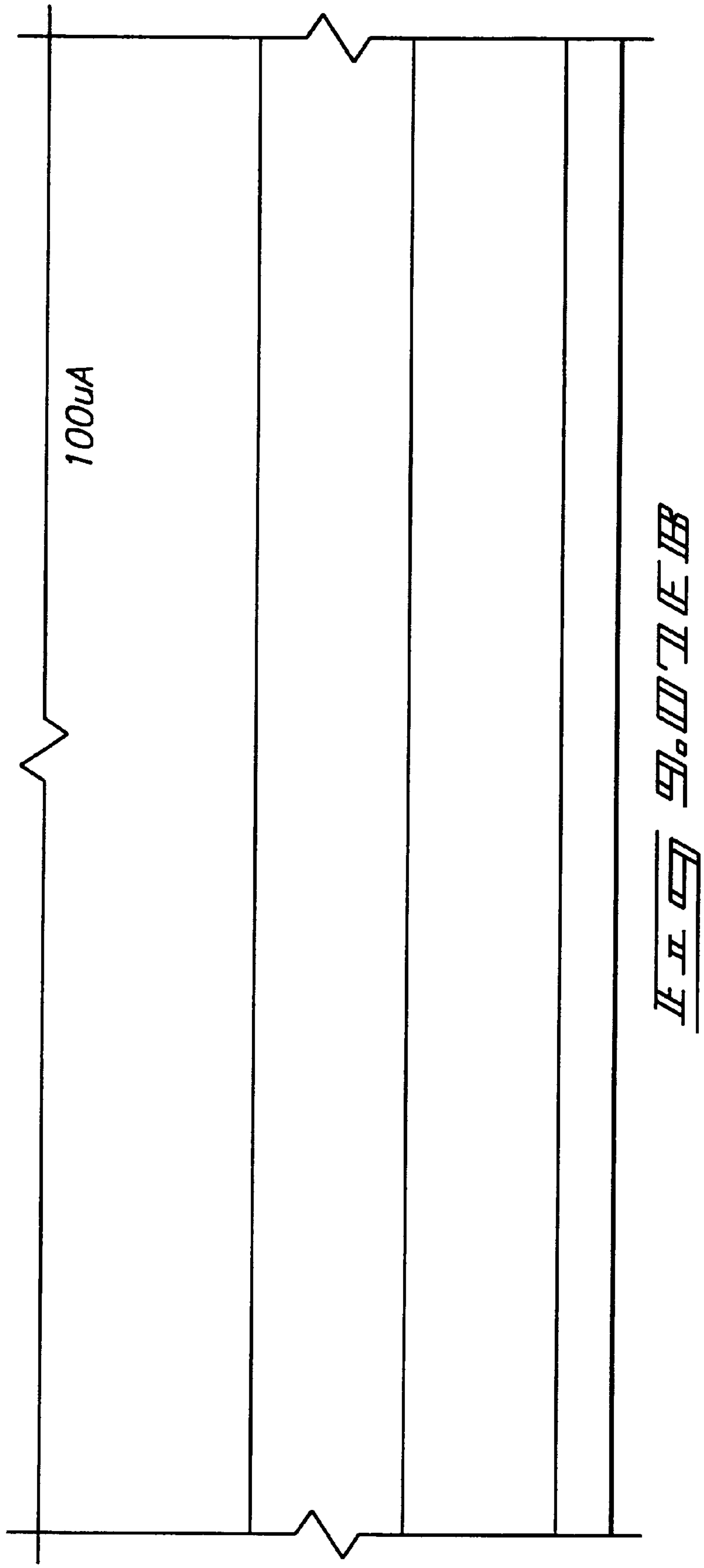
FIG. 9.07EB

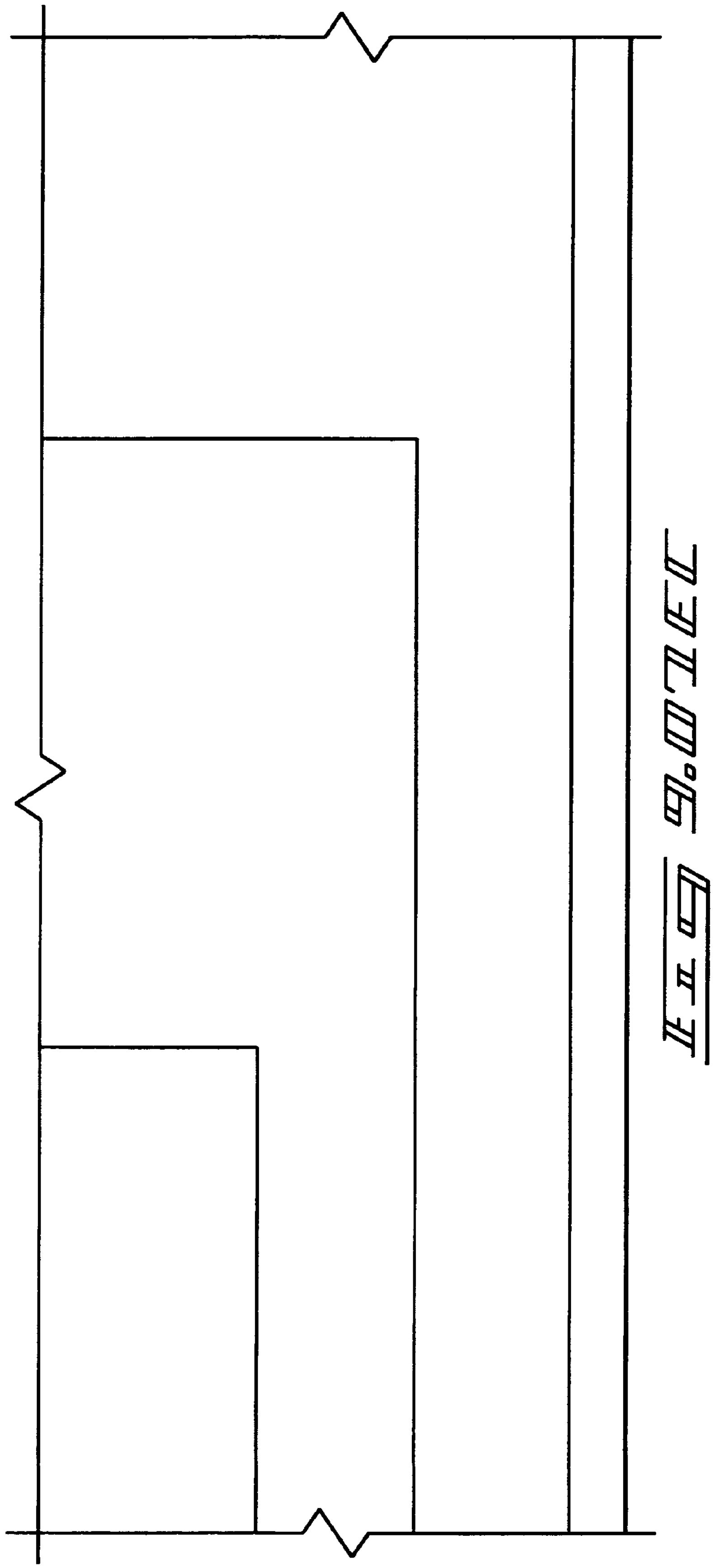
Fig. 9.07EC

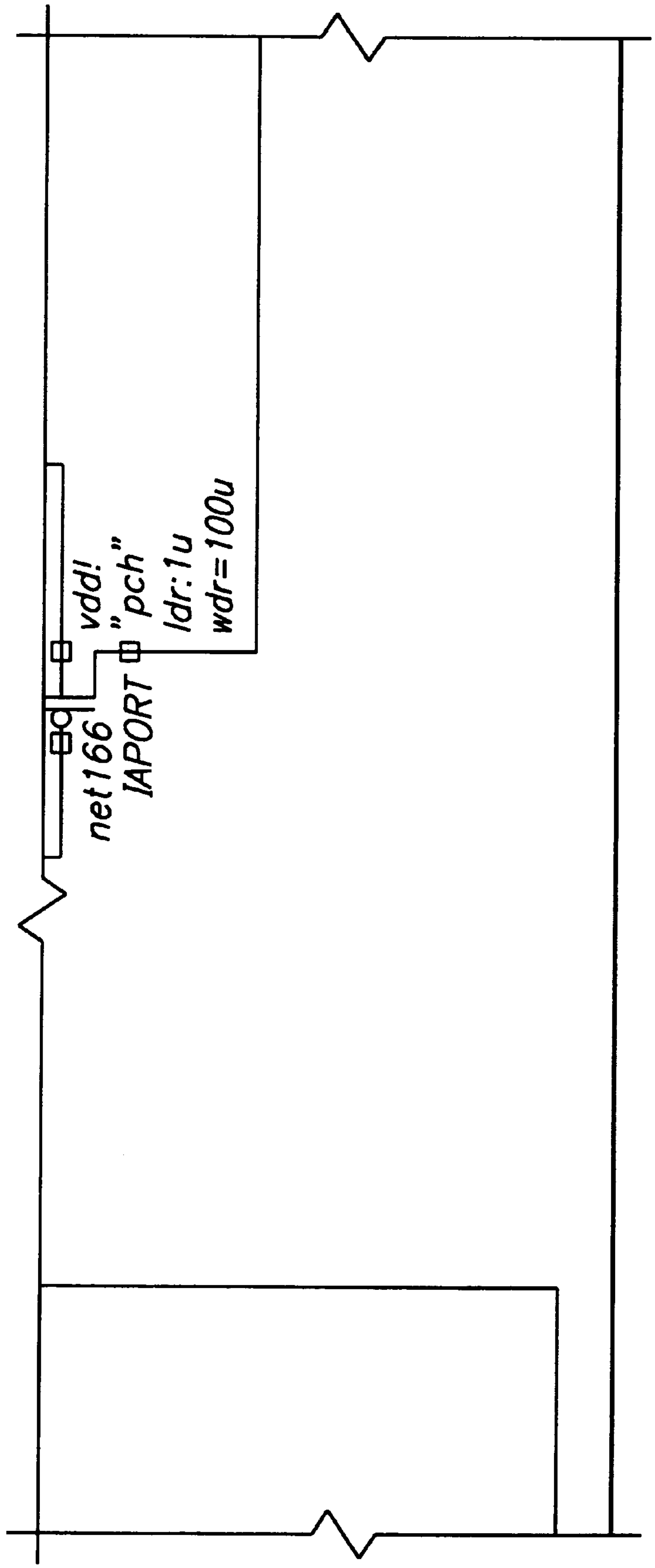
Fig. 9.07ED

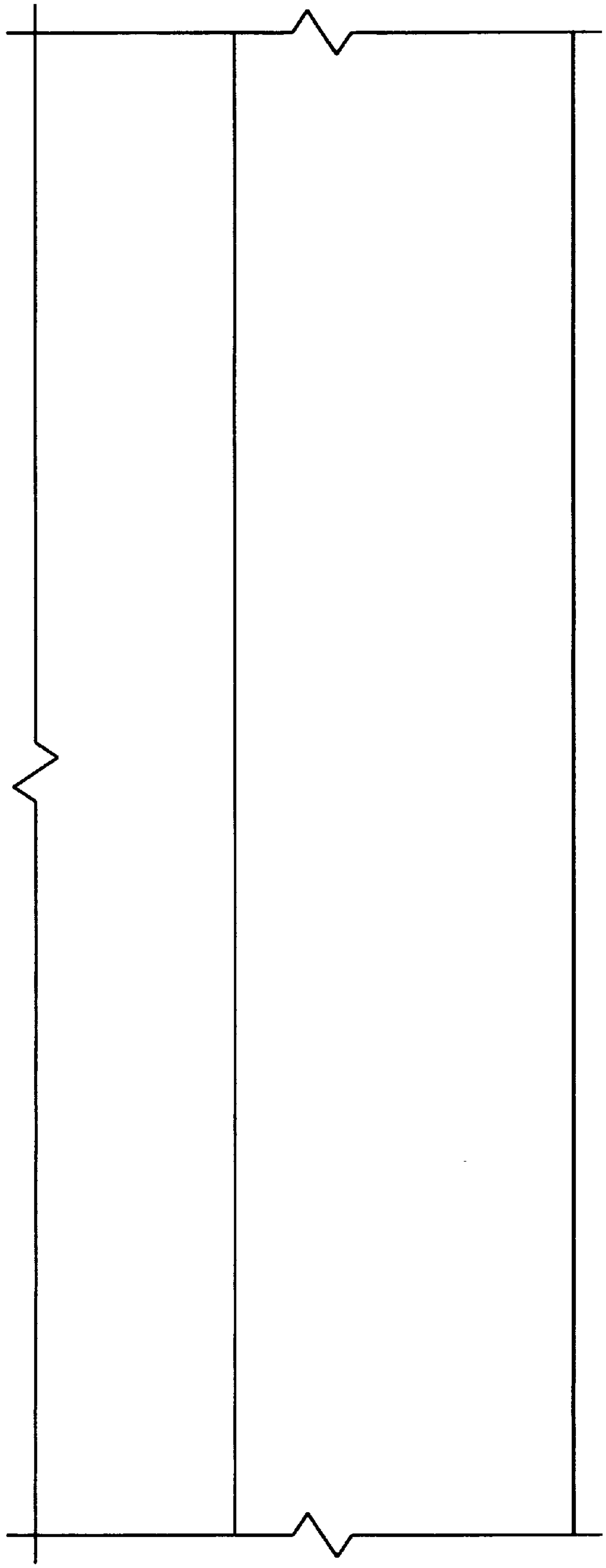
Fig. 9.07EE

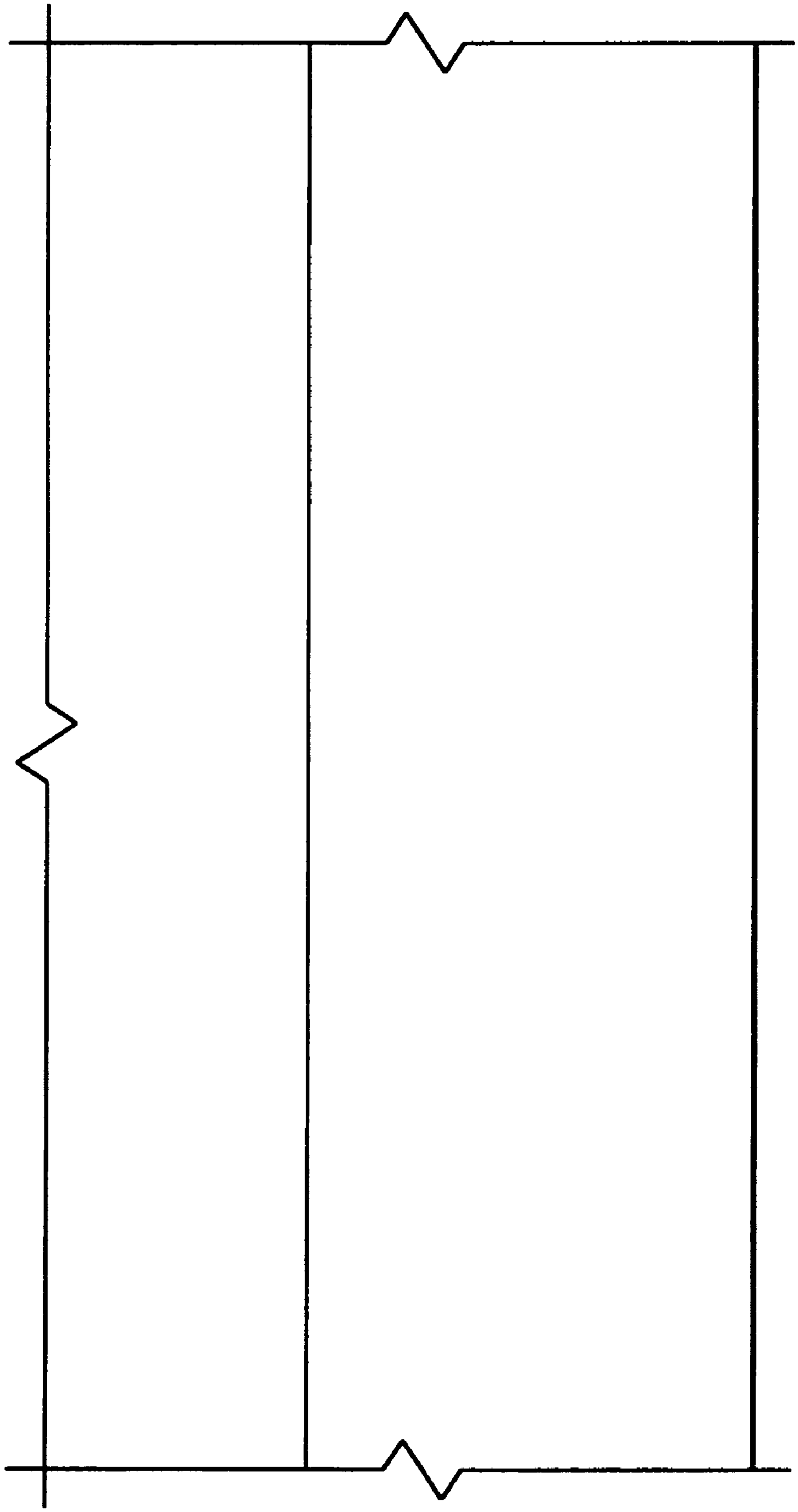
Fig. 9.07EF

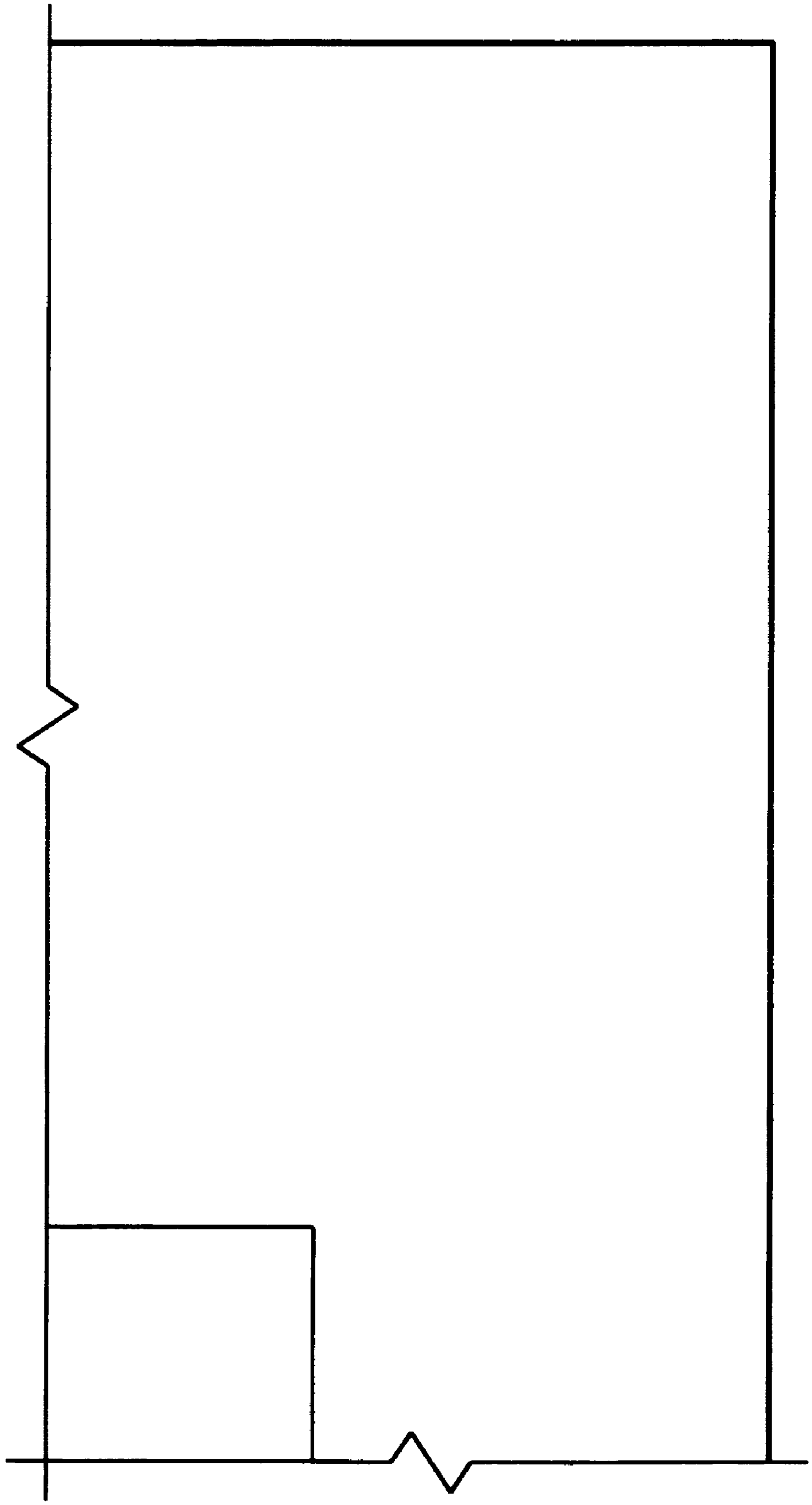
FIG. 9.07EG

| | | |
|---|---|---|
| 9.08AA | 9.08AB | 9.08AC |
| 9.08BA | 9.08BB | 9.08BC |
| 9.08CA | 9.08CB | 9.08CC |

Fig 9.08

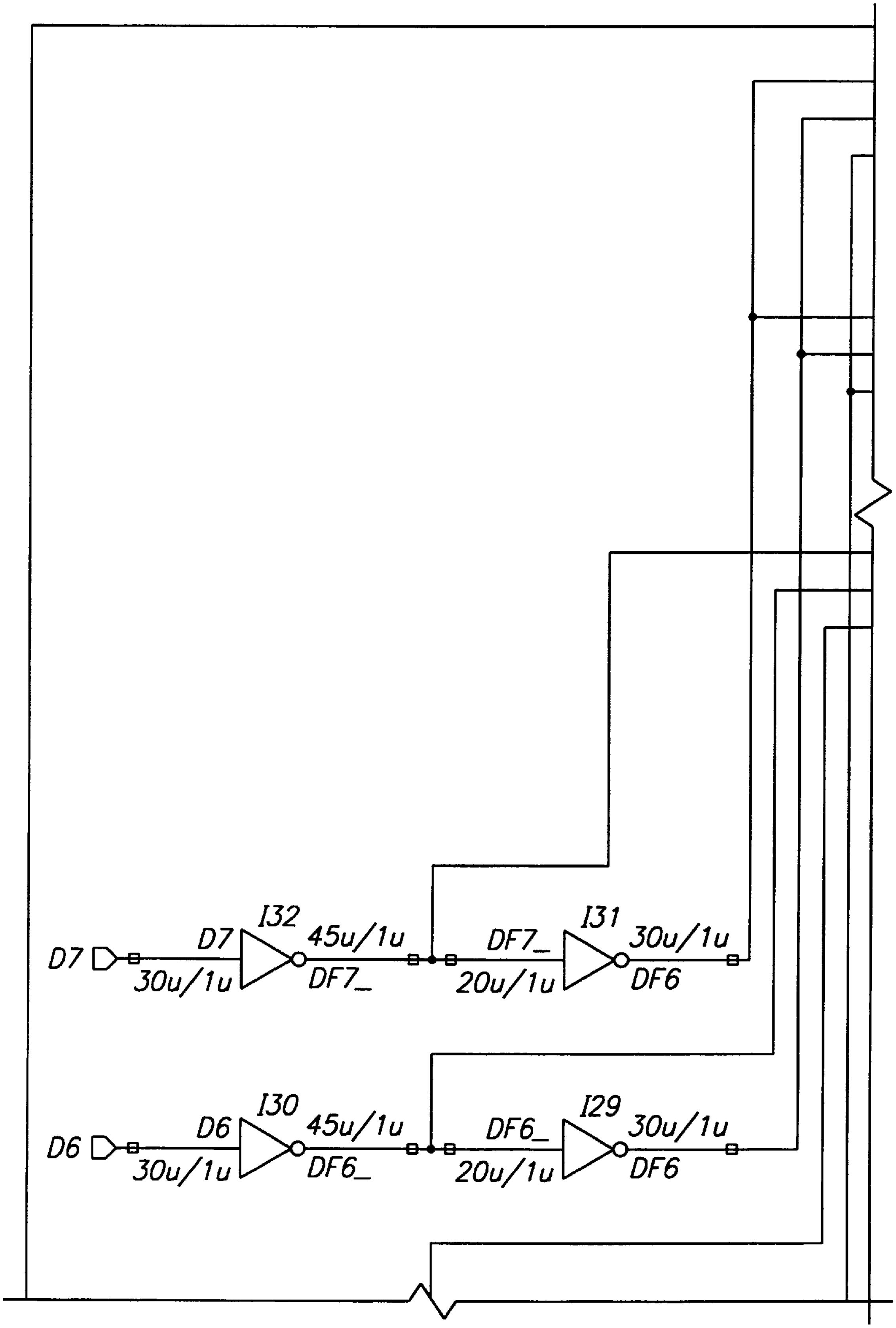
Fig 9.08AA

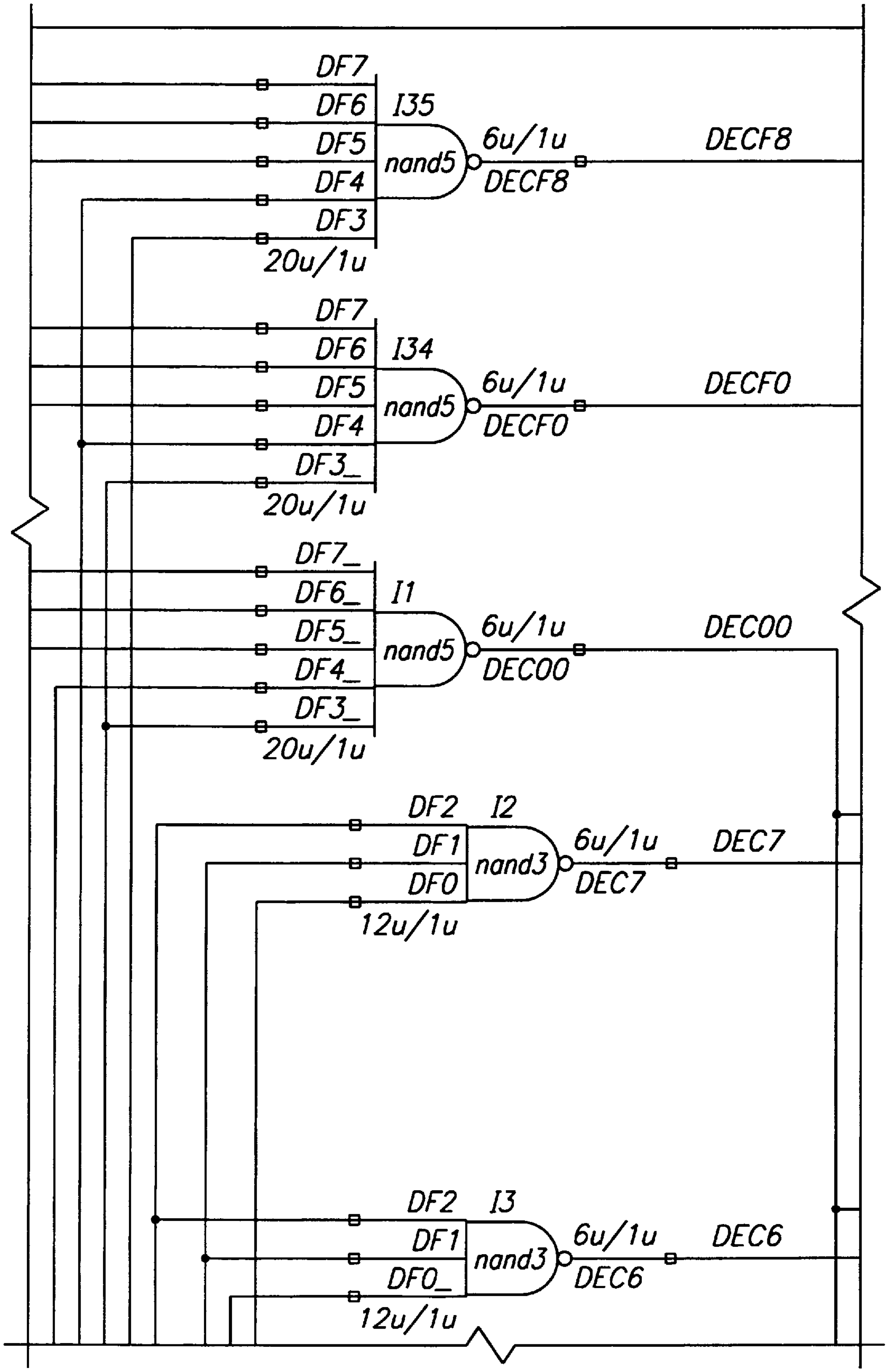
Fig 9.08AB

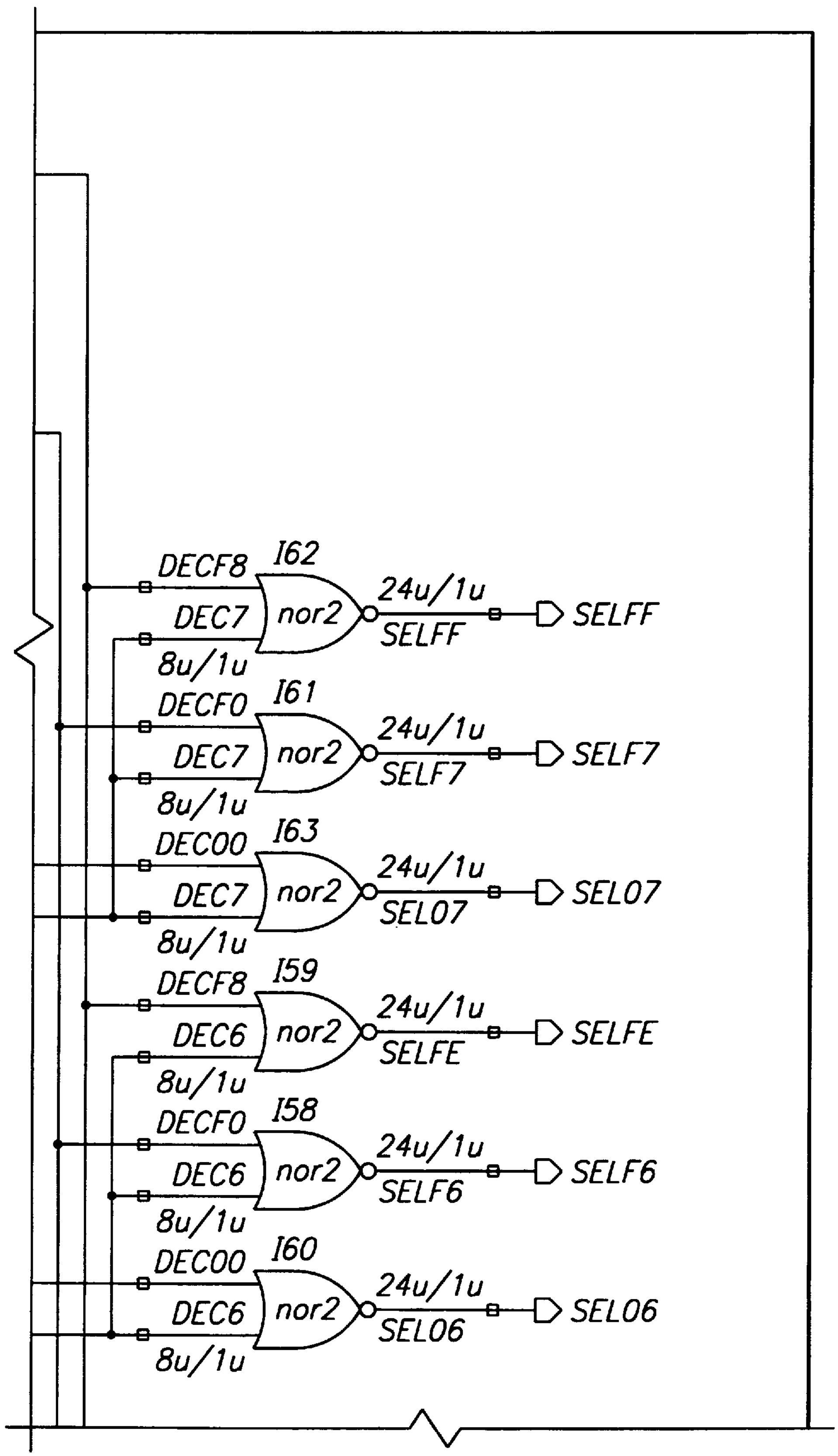
FIG 9.08AC

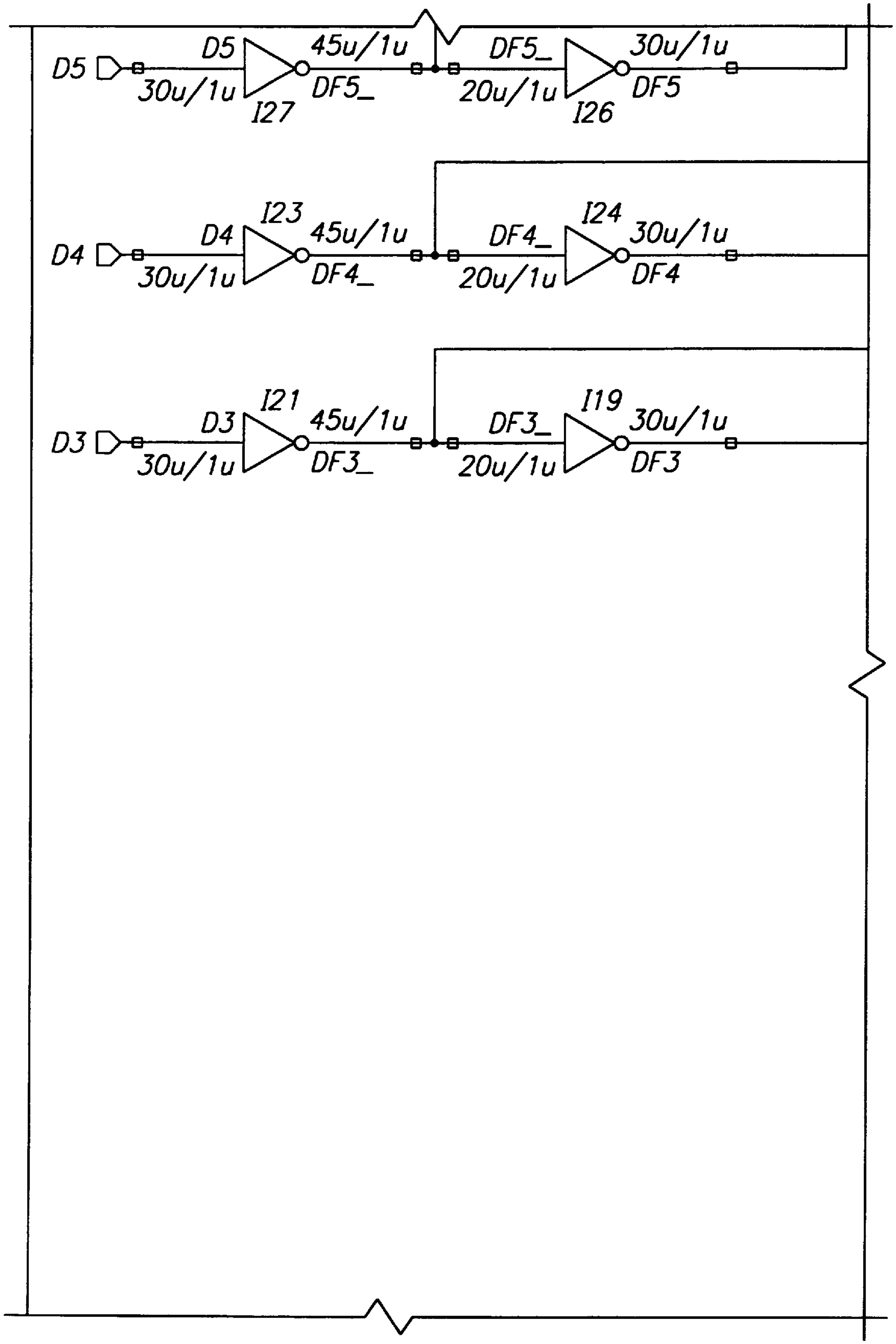
Fig 9.08BA

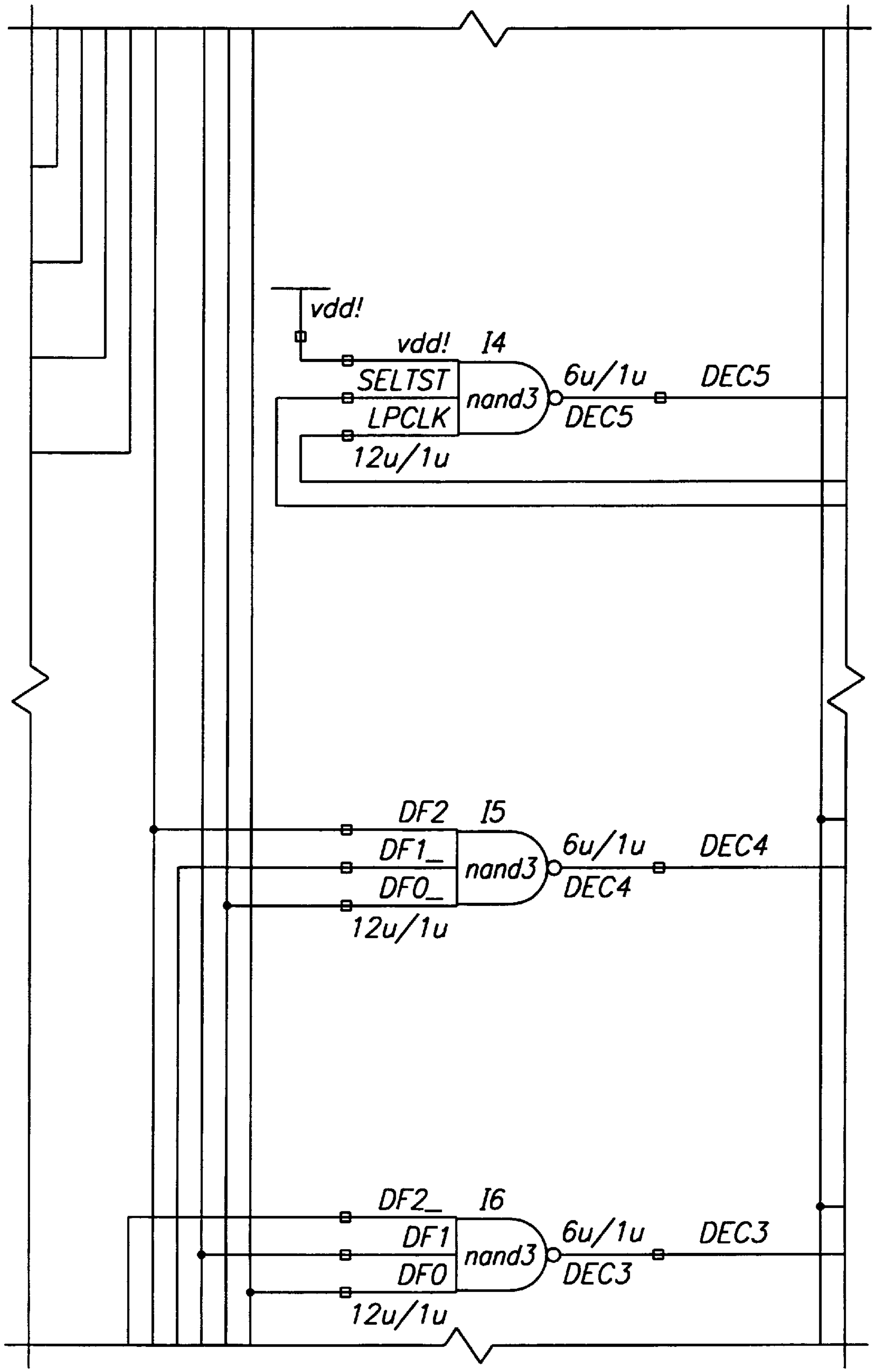
FIG 9.08BB

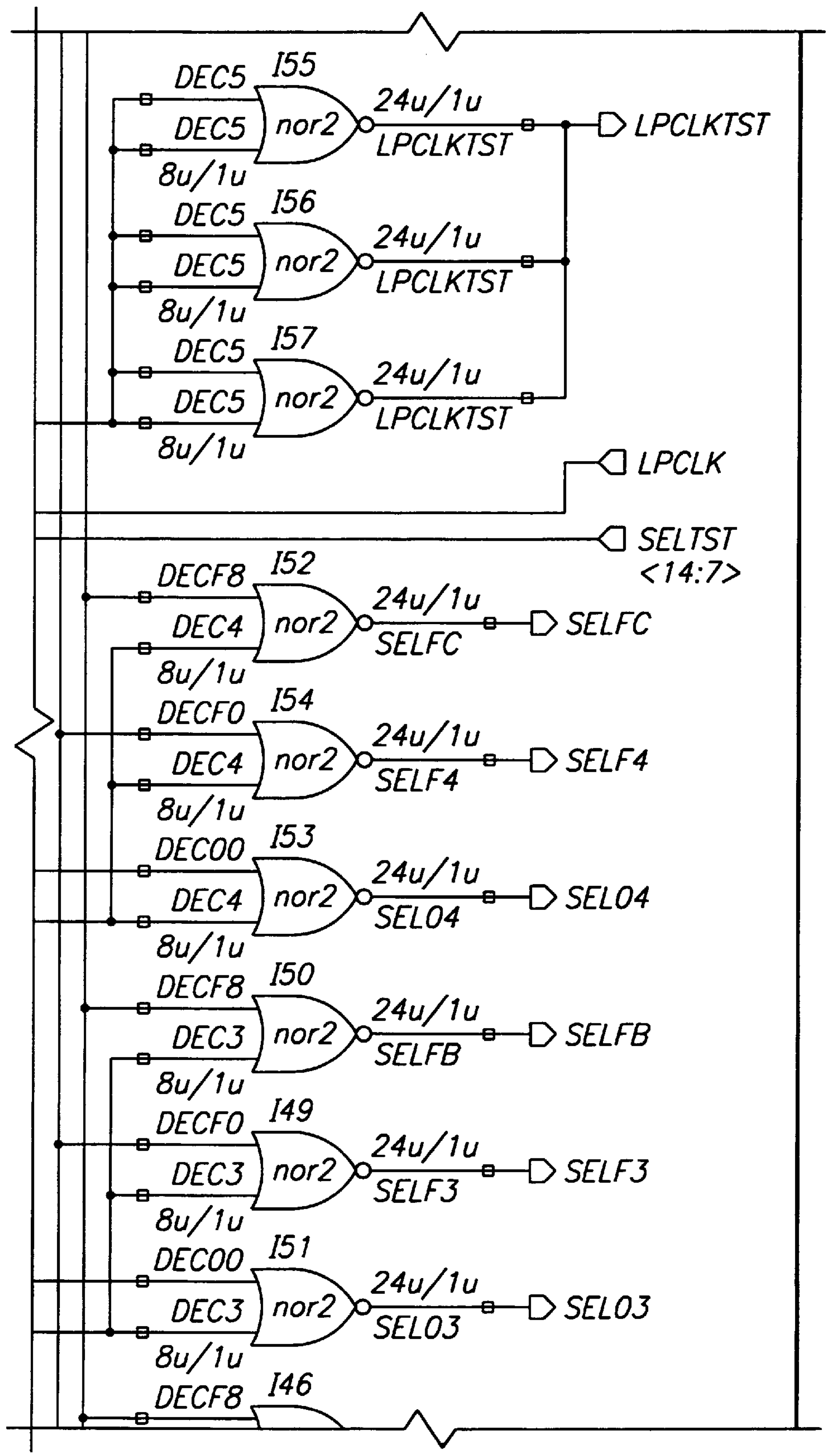
Fig 9.08BC

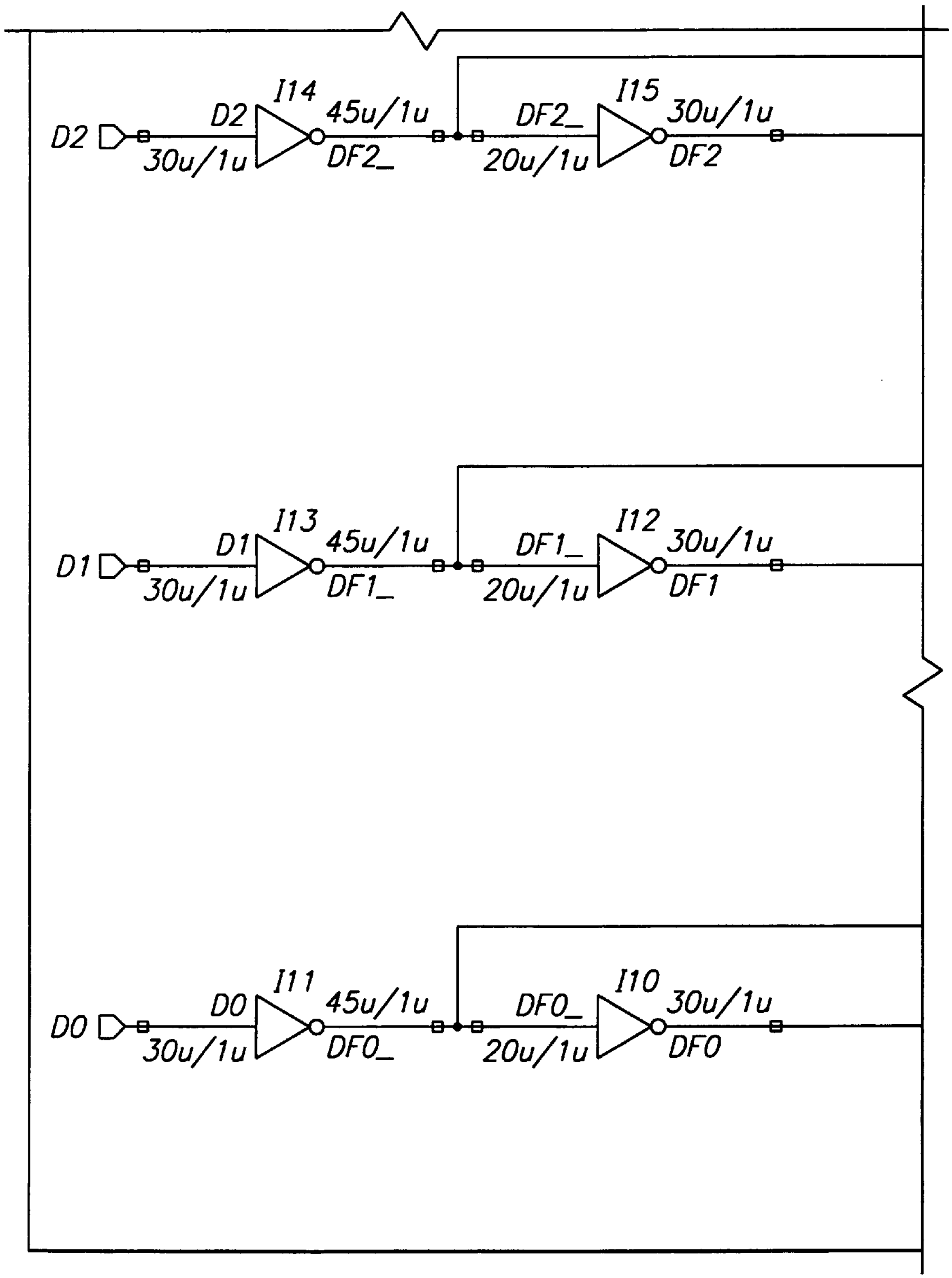
Fig 9.08CA

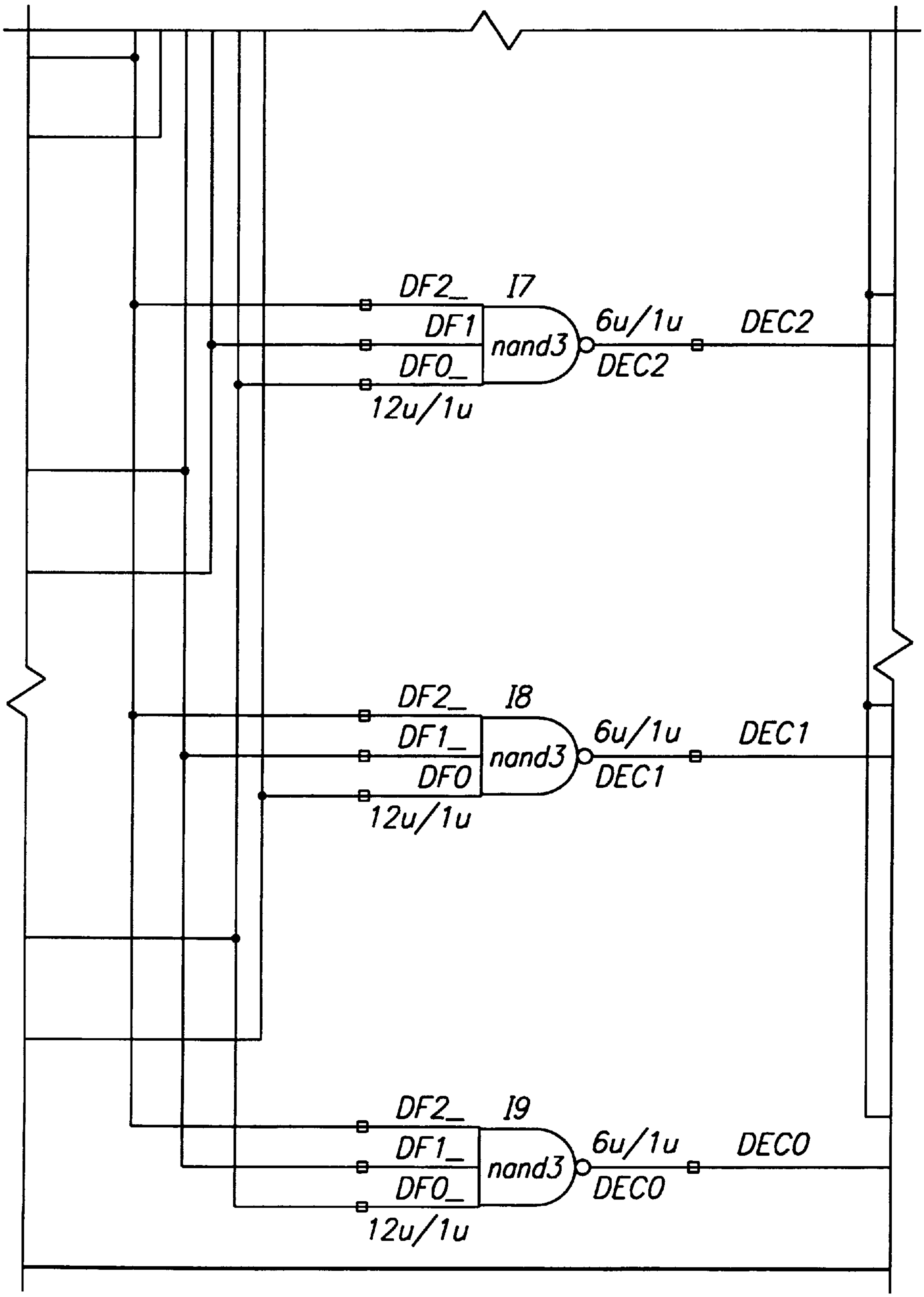
Fig 9.08CB

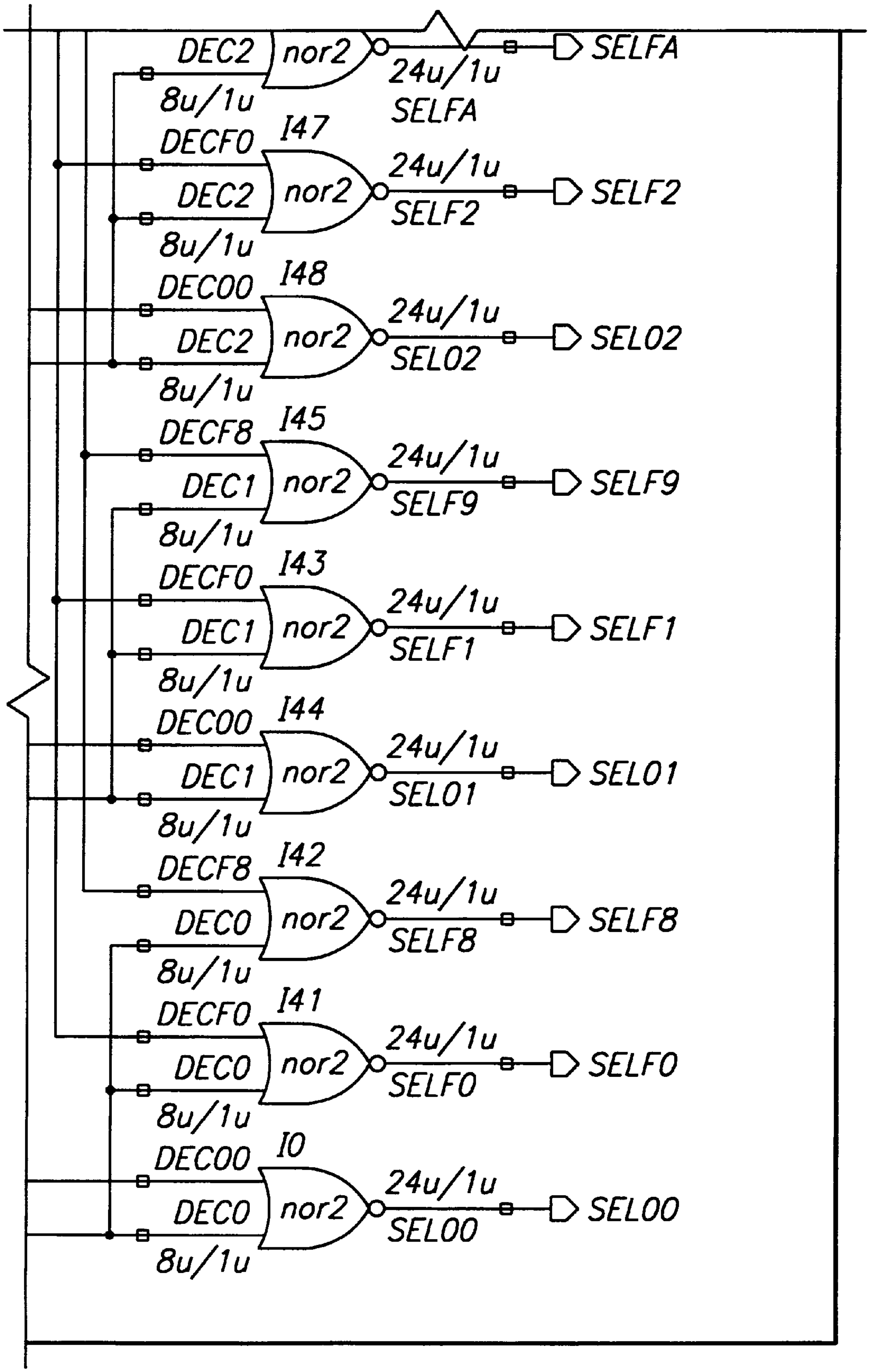
Fig 9.08CC

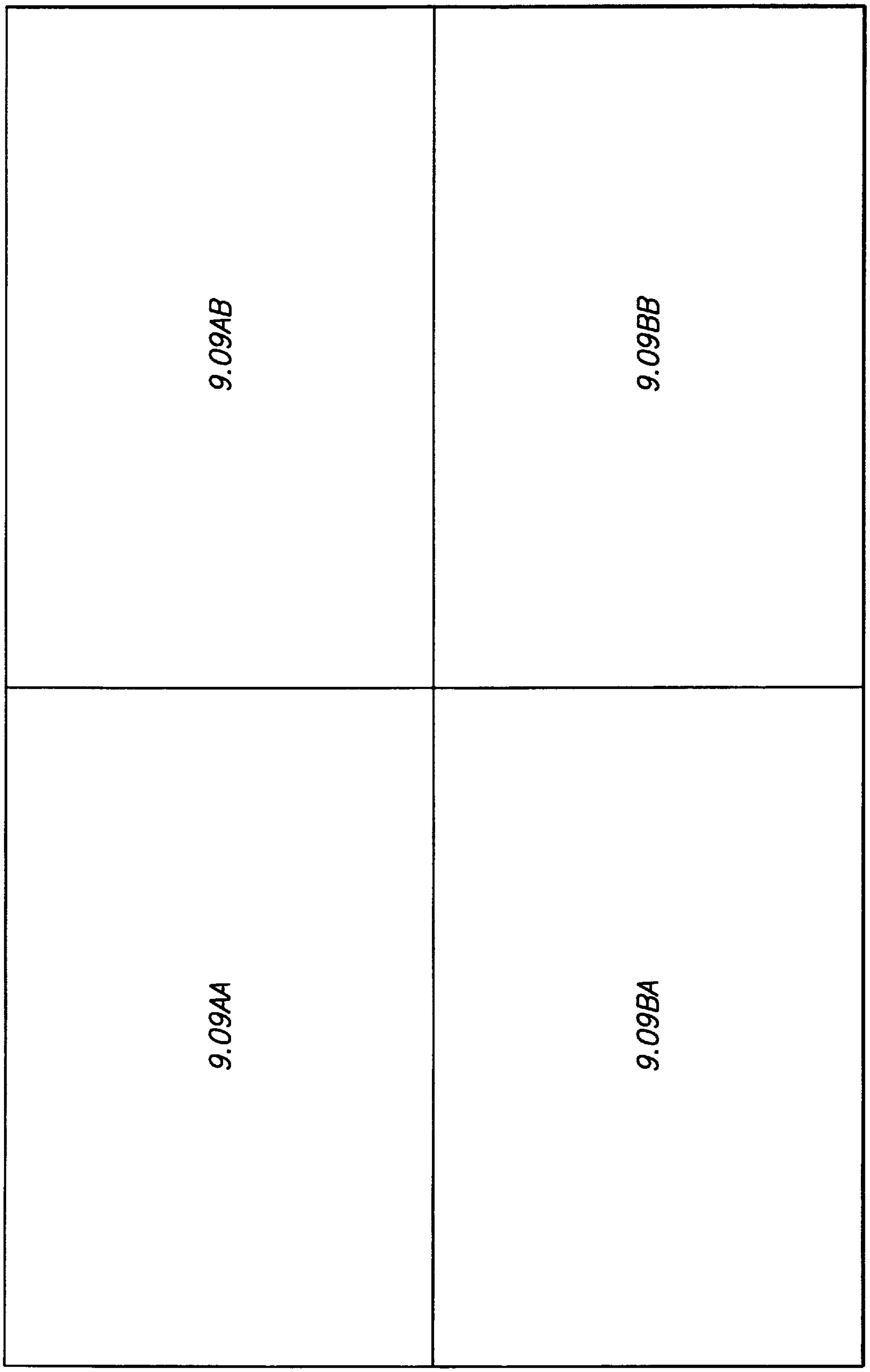
FIG. 9.09

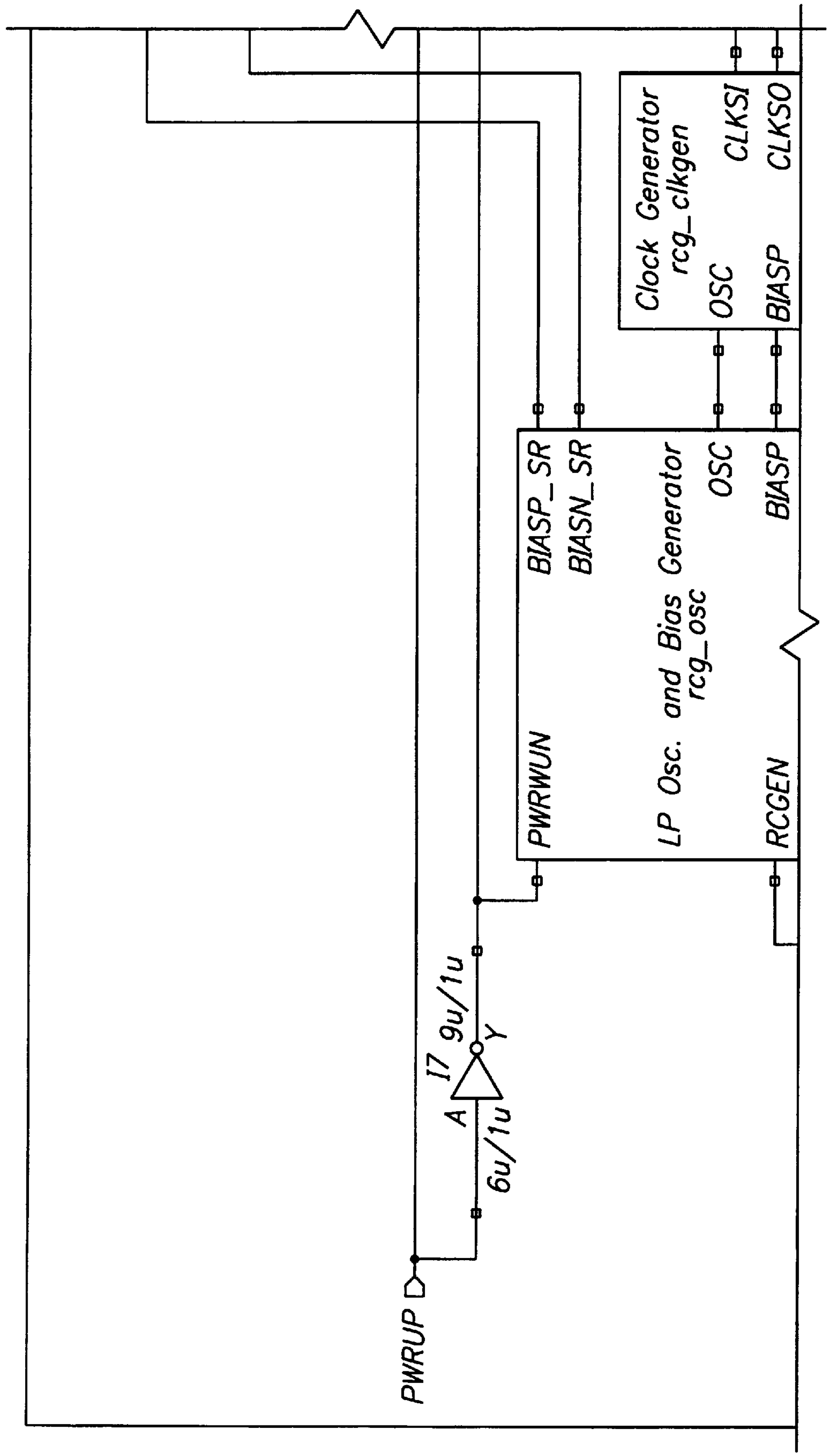
Fig. 9.09AA

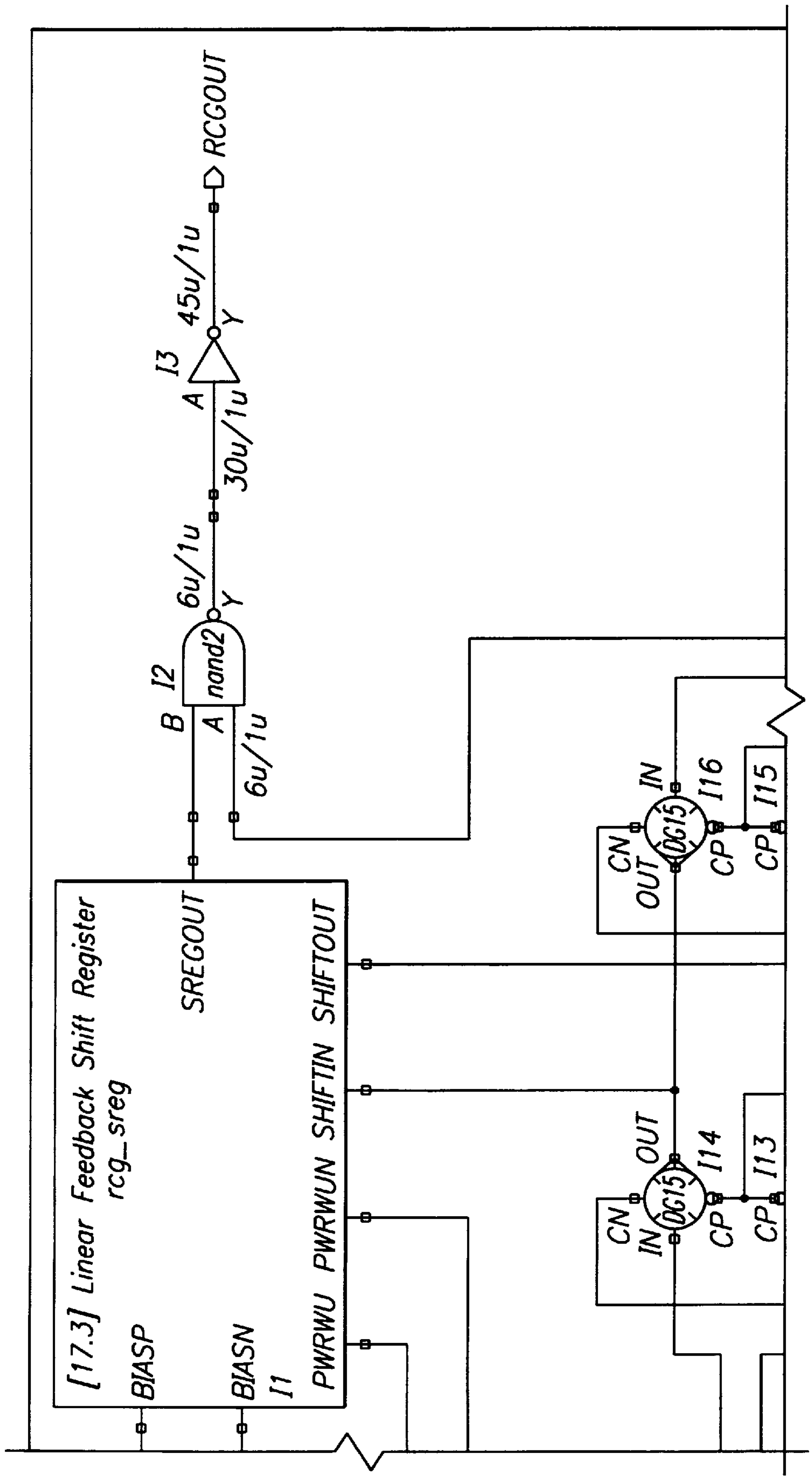
FIG. 9.09AB

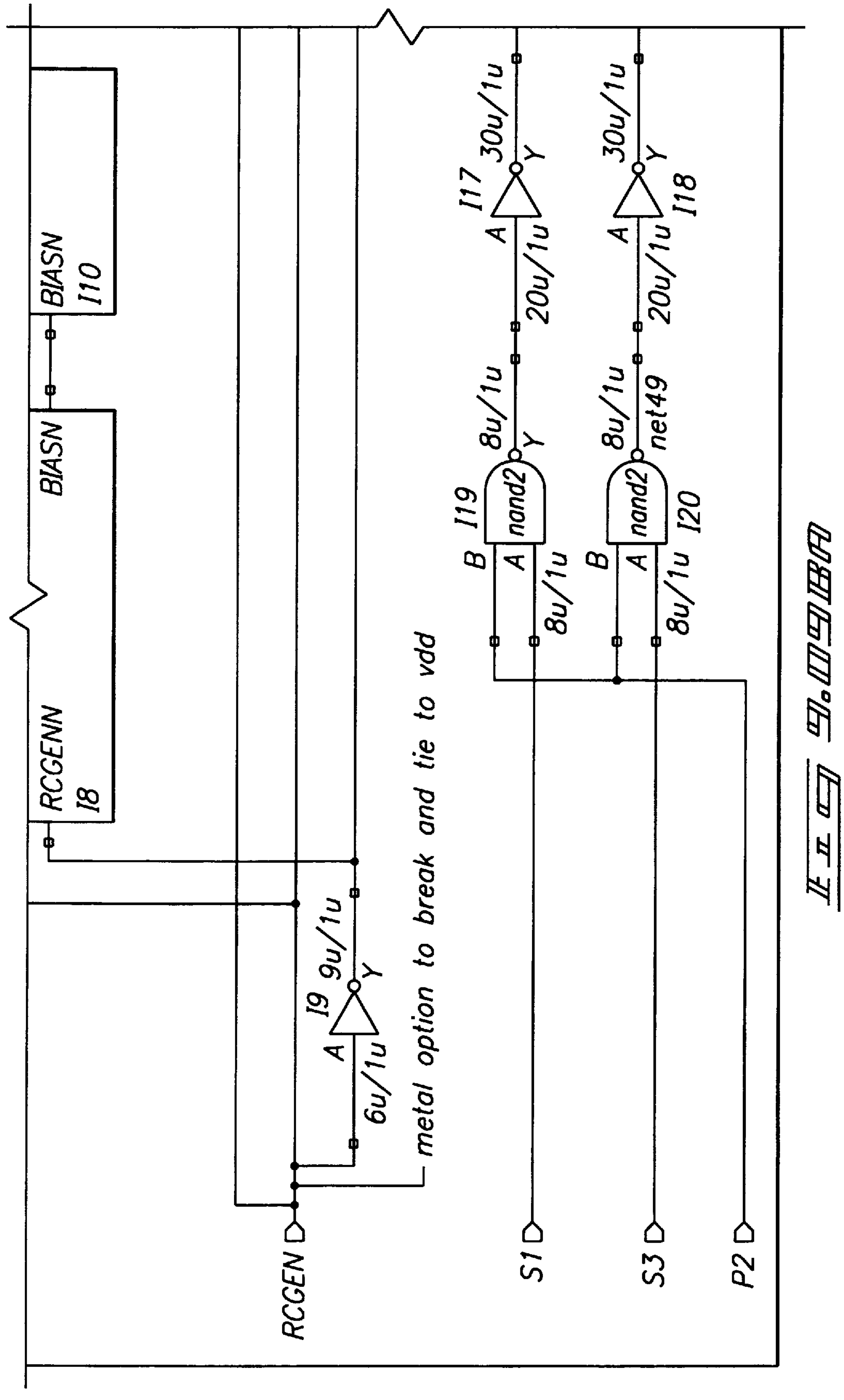
FIG. 9.09BA

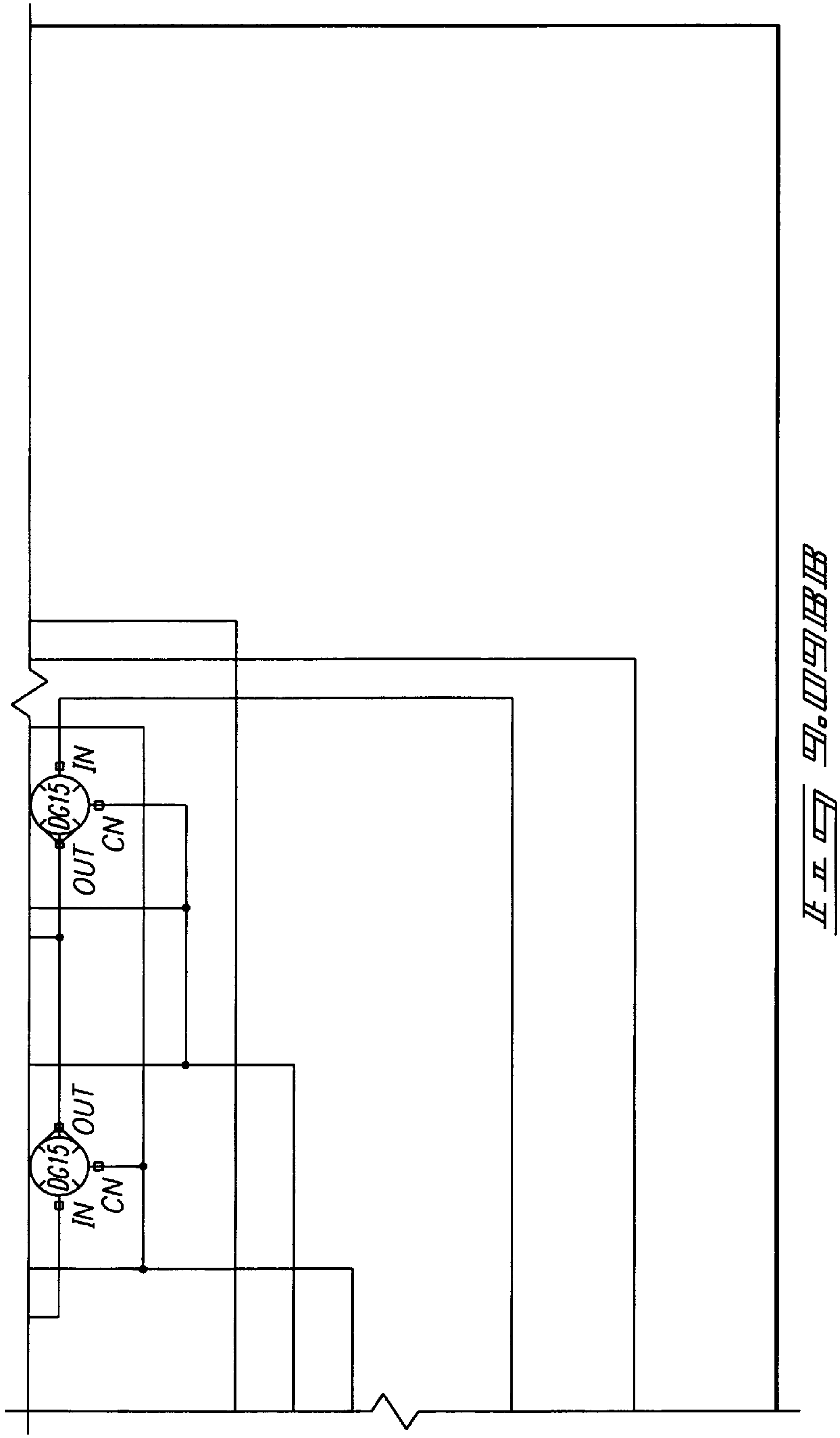
Fig. 9.09BB

| | | | | | | | |
|---|---|---|---|---|---|---|---|
| 9.0901AA | 9.0901AB | 9.0901AC | 9.0901AD | 9.0901AE | 9.0901AF | 9.0901AG | 9.0901AH |
| 9.0901BA | 9.0901BB | 9.0901BC | 9.0901BD | 9.0901BE | 9.0901BF | 9.0901BG | 9.0901BH |
| 9.0901CA | 9.0901CB | 9.0901CC | 9.0901CD | 9.0901CE | 9.0901CF | 9.0901CG | 9.0901CH |

Fig 9.0901

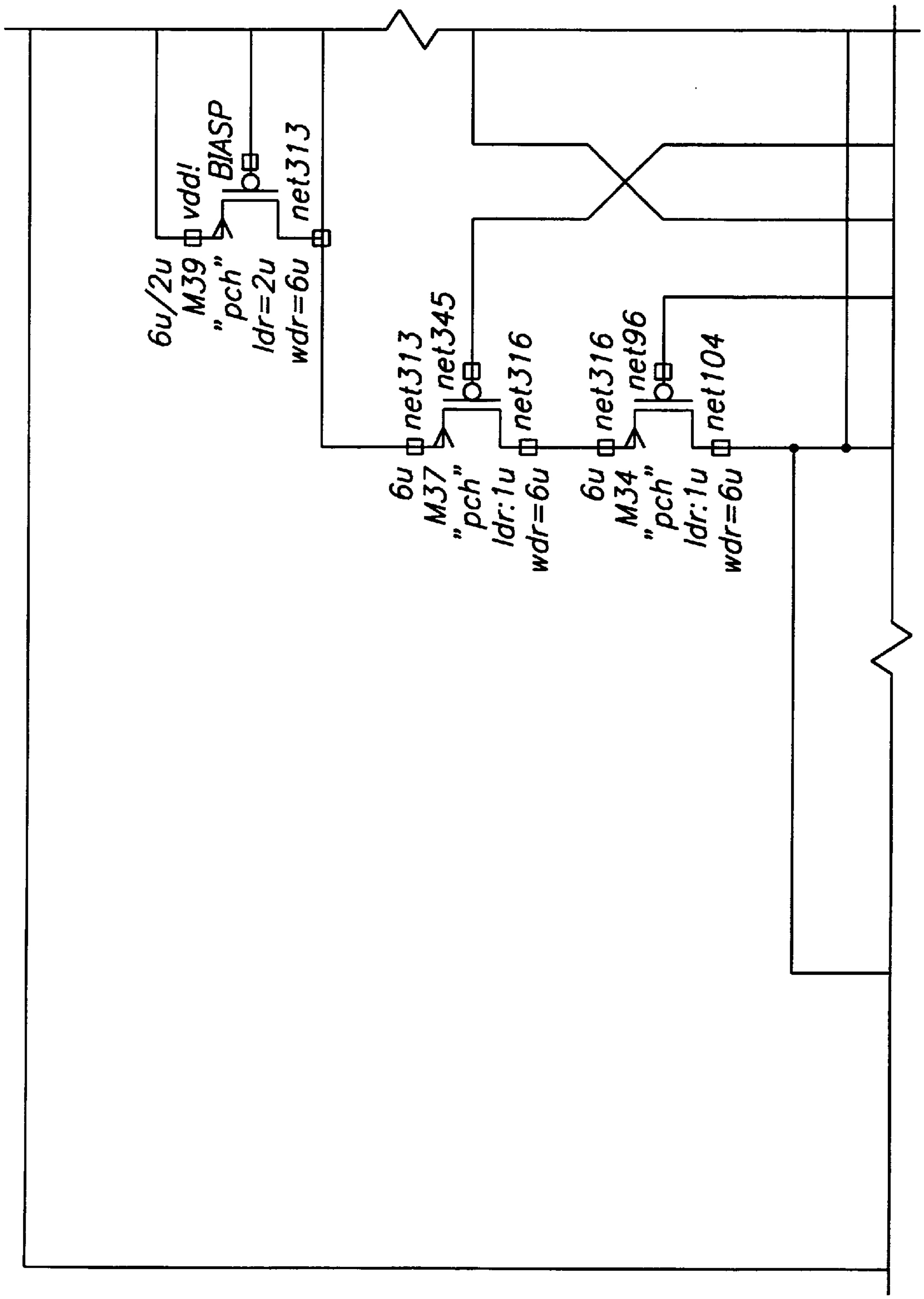
FIG. 9.0601AA

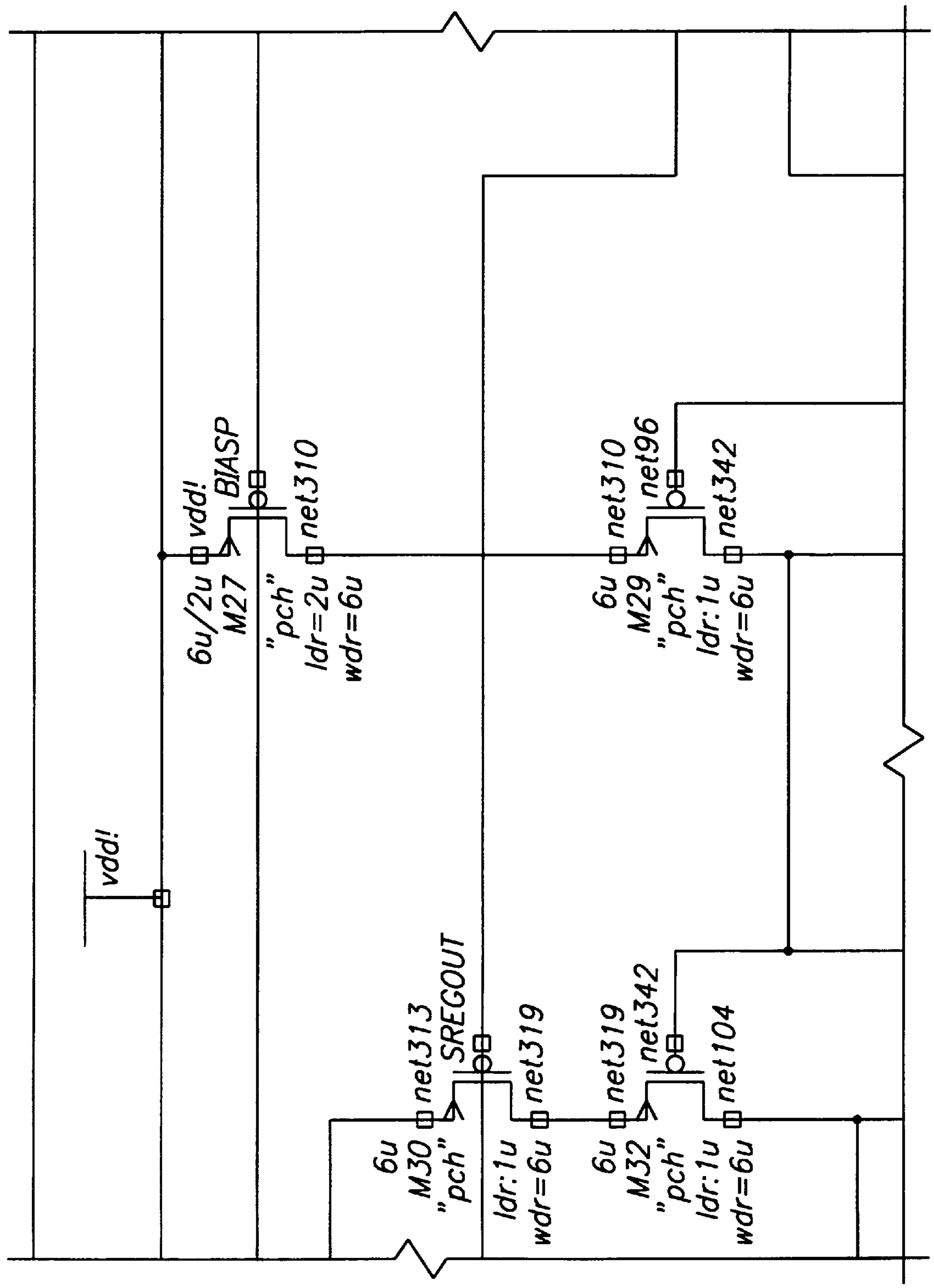
FIG. 9.0901AB

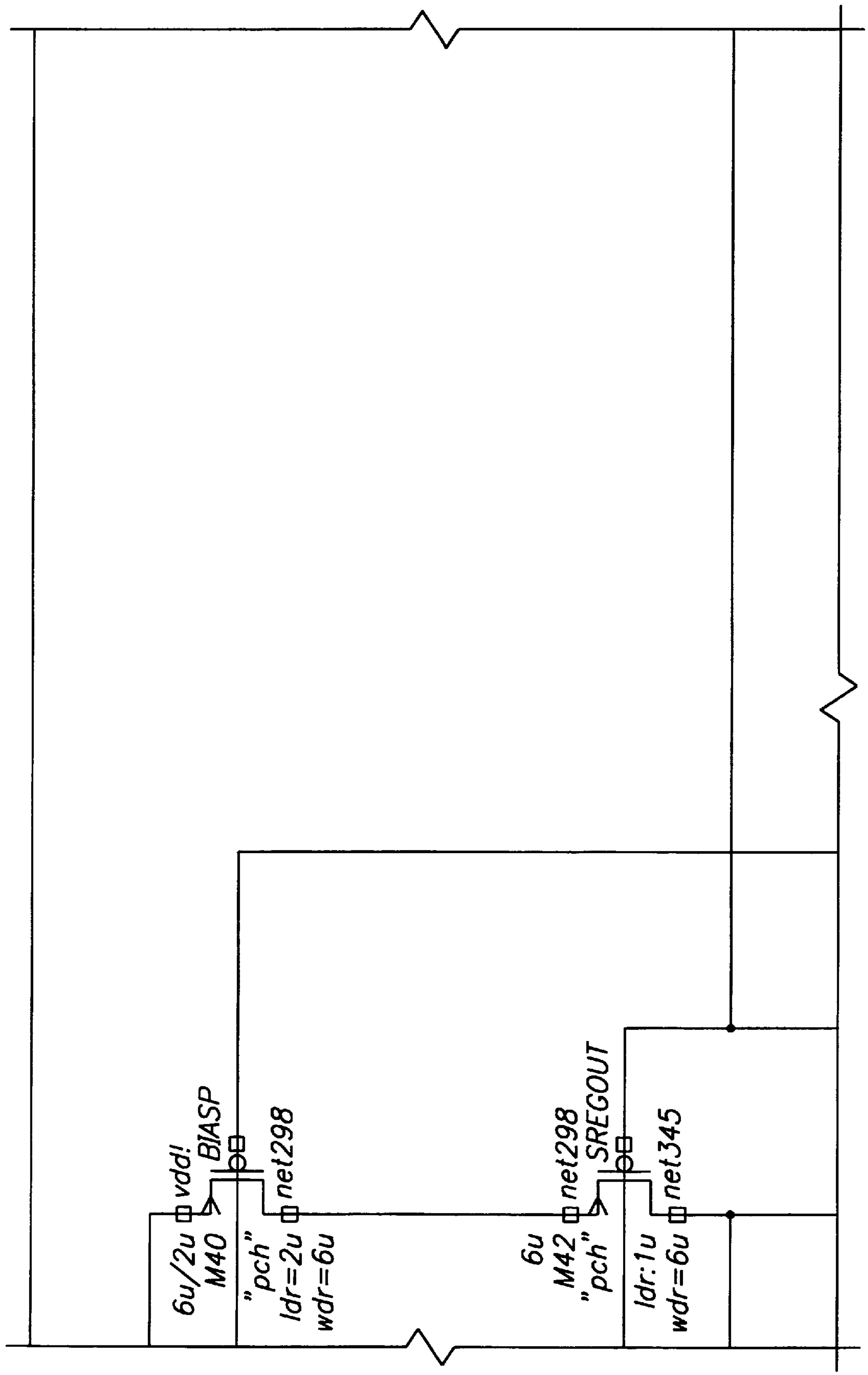
FIG 9.0901AC

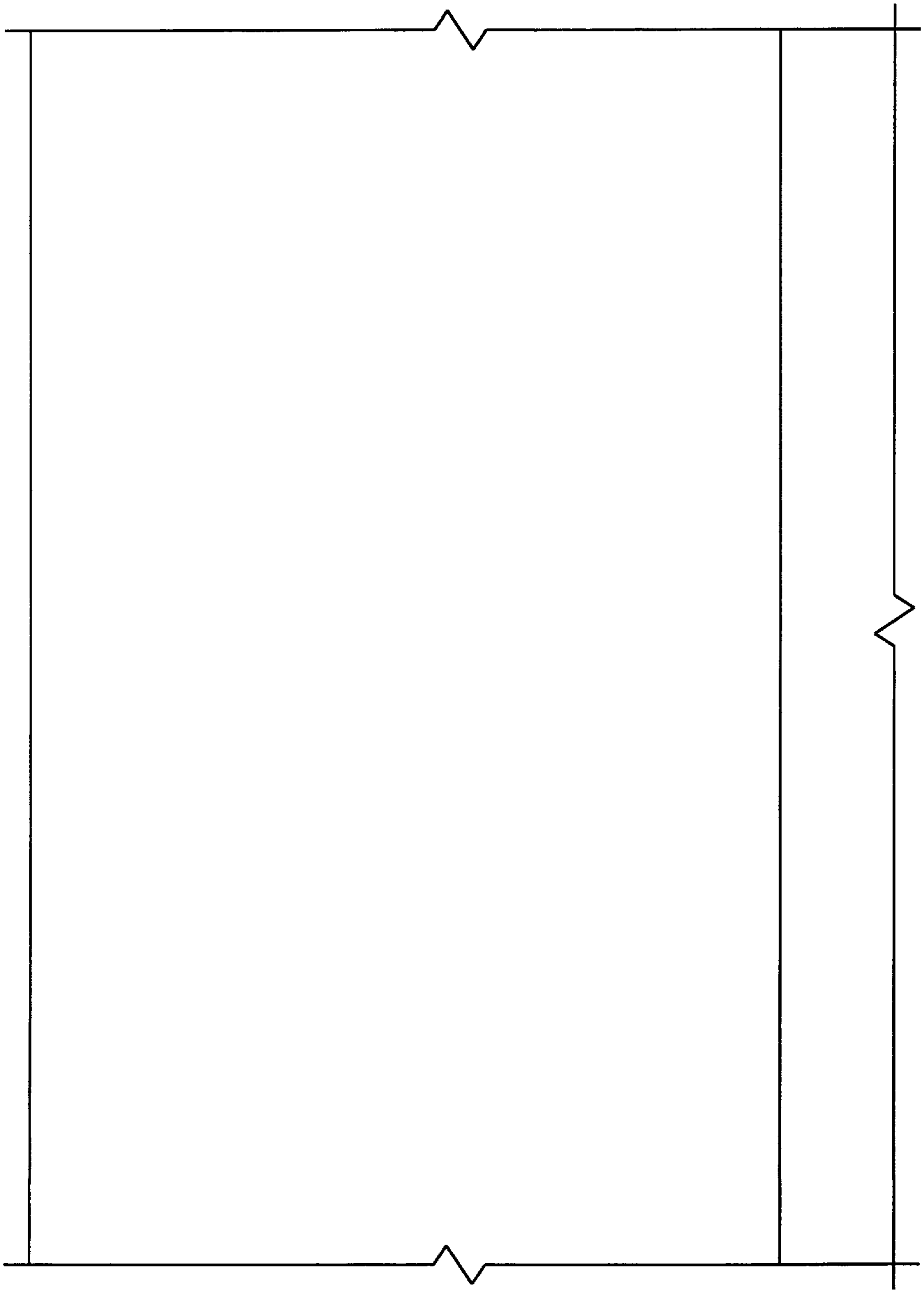
FIG. 9.0901AD

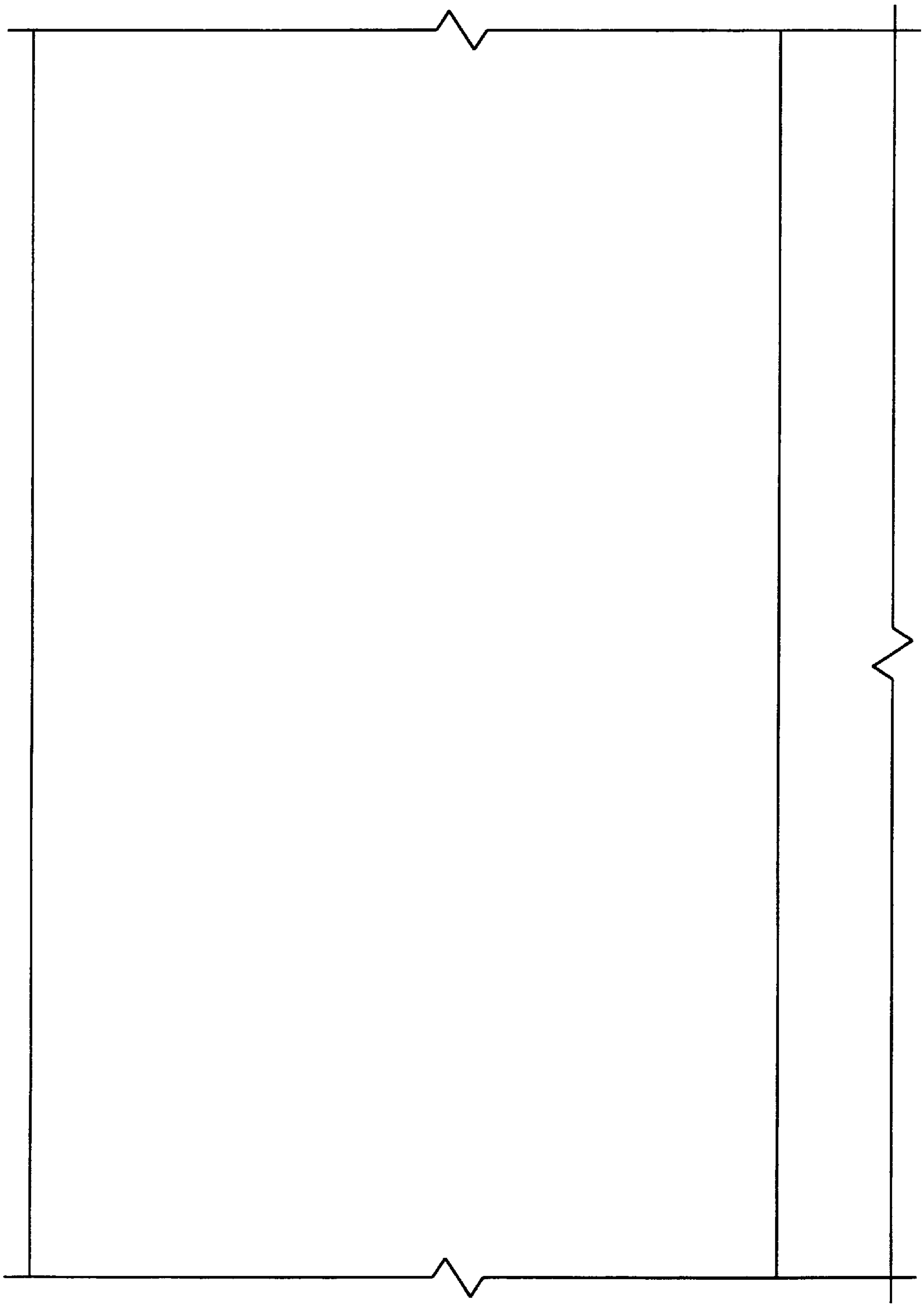
FIG. 9.0901AE

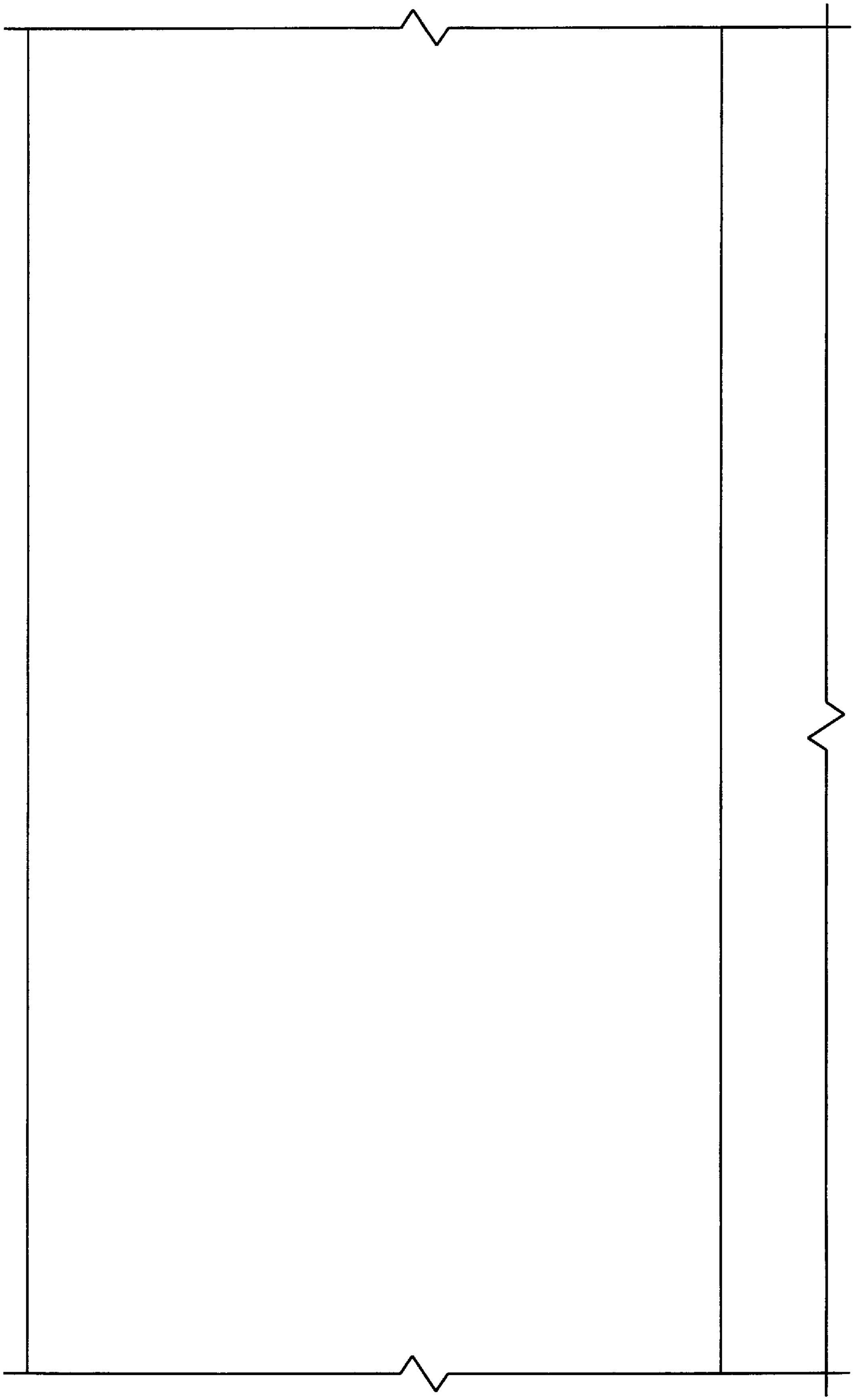
FIG. 9.0901AF

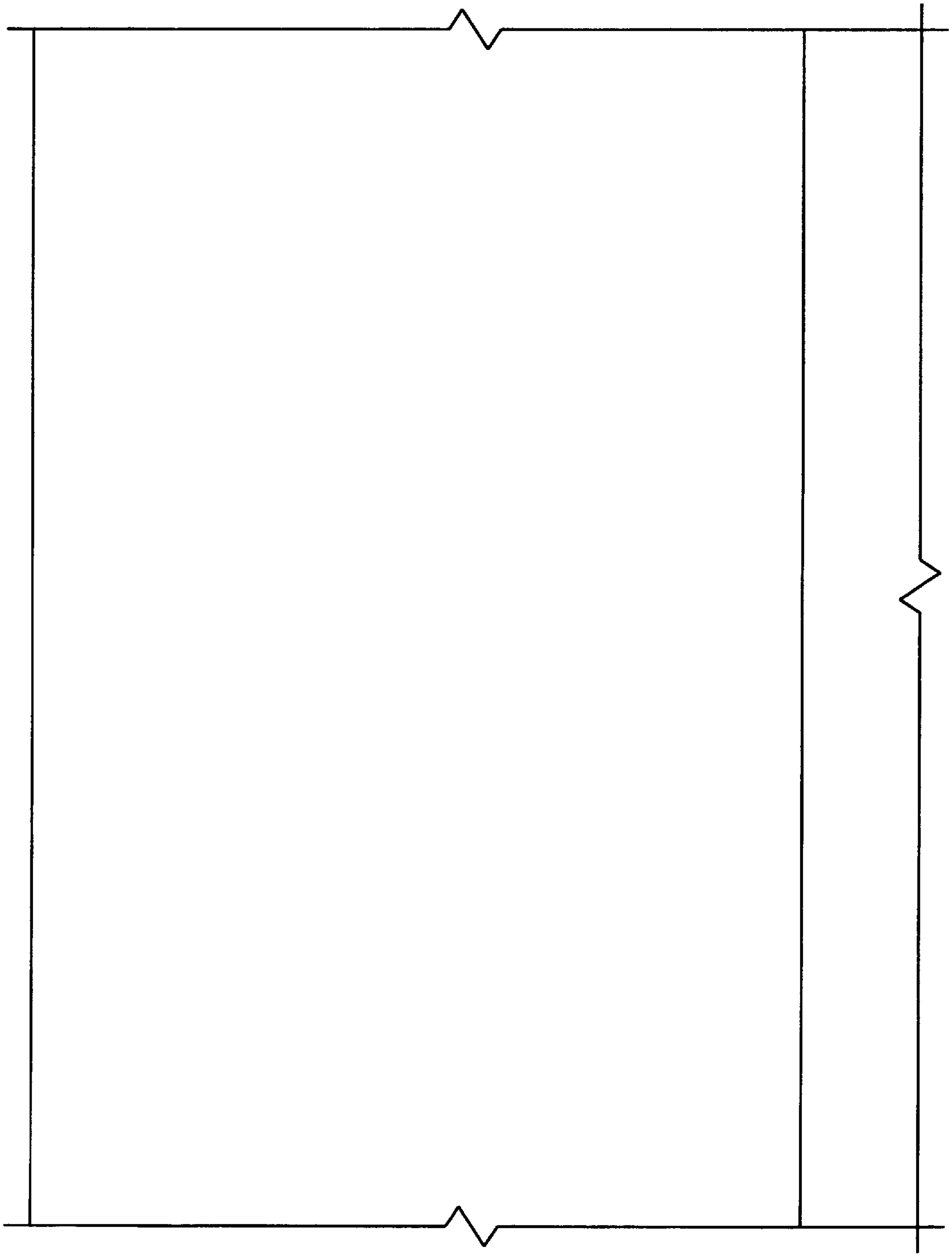
FIG. 9.0901AG

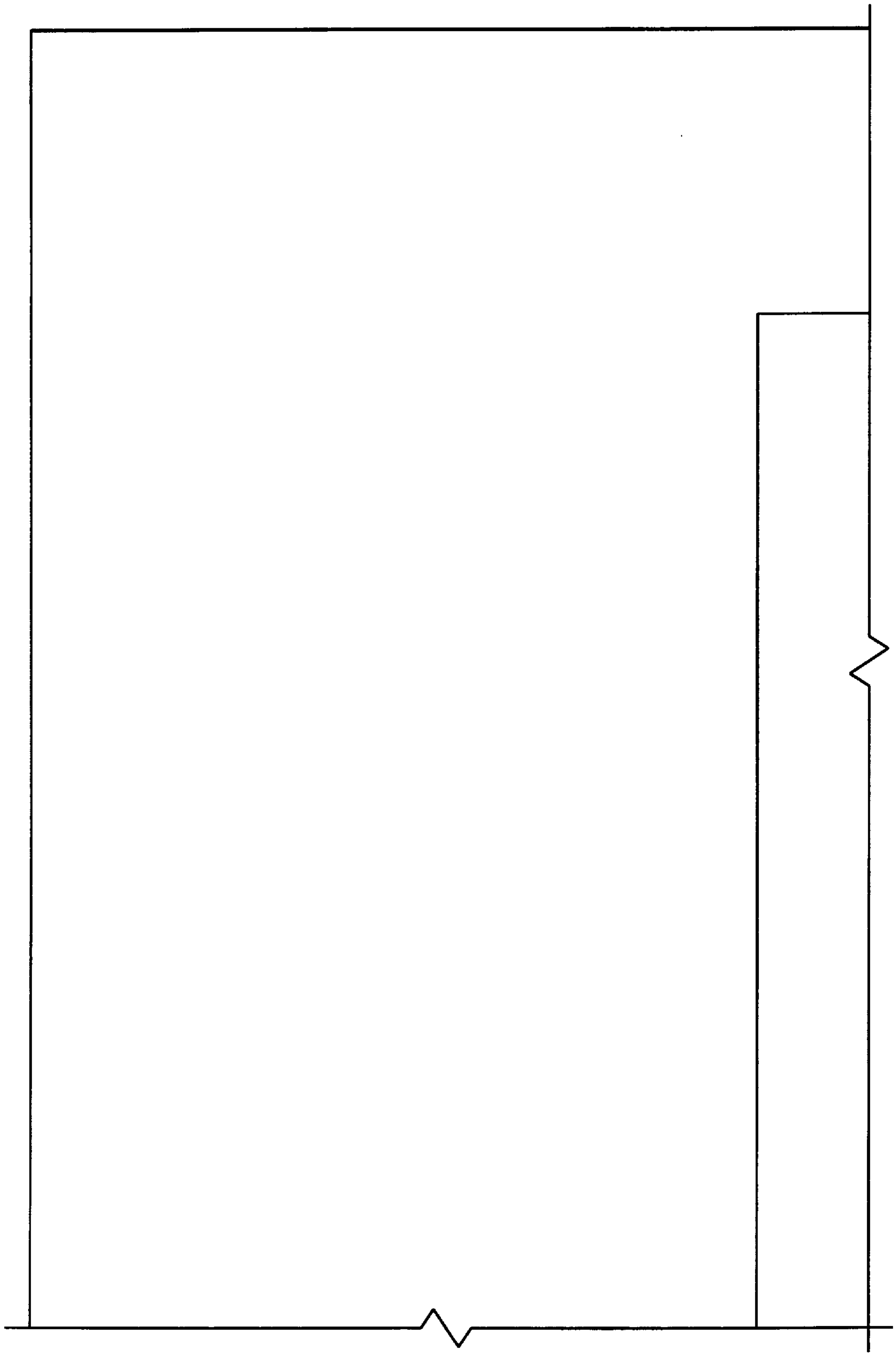
FIG. 9.0901AH

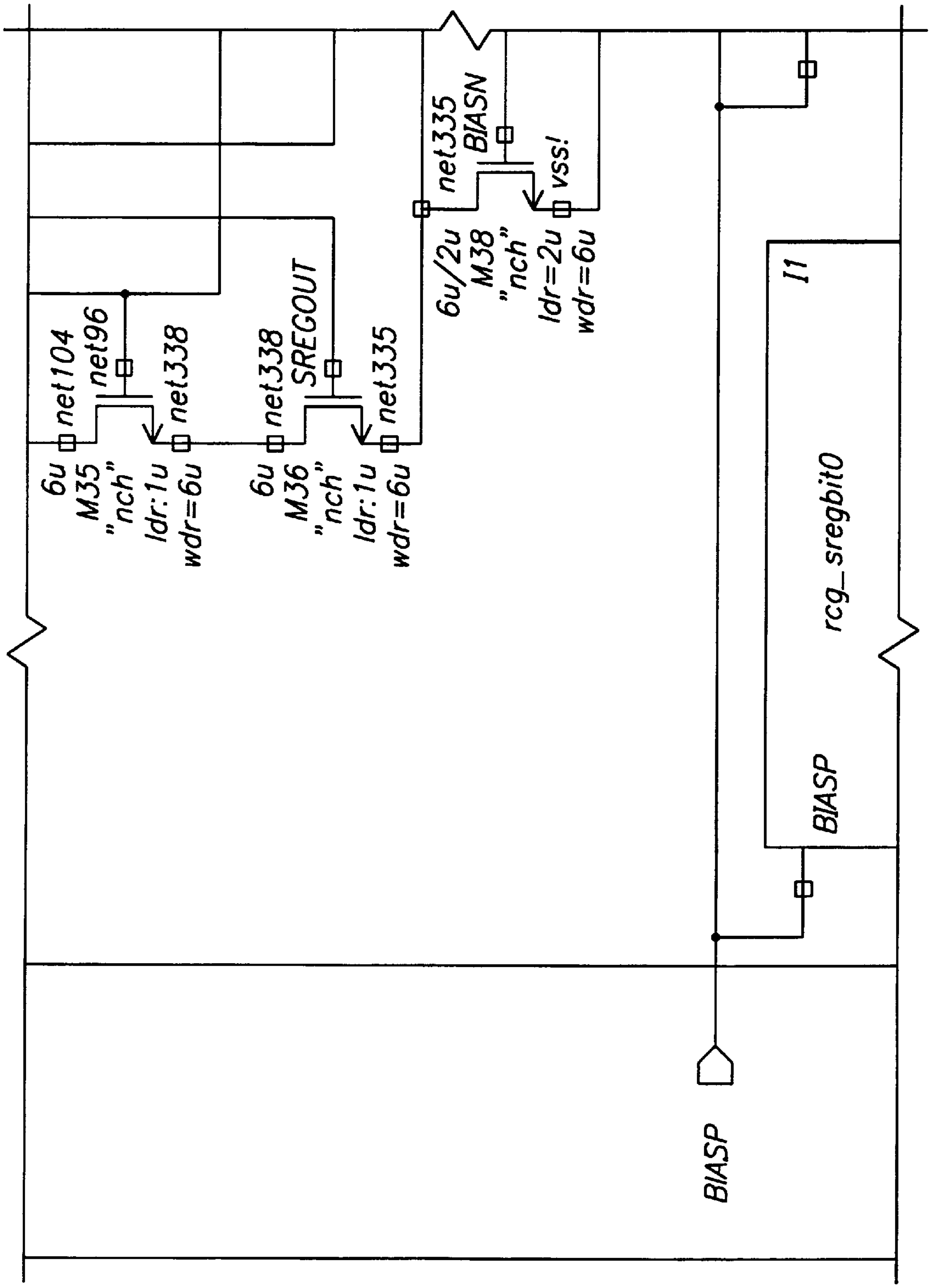
Fig. 9.0901BA

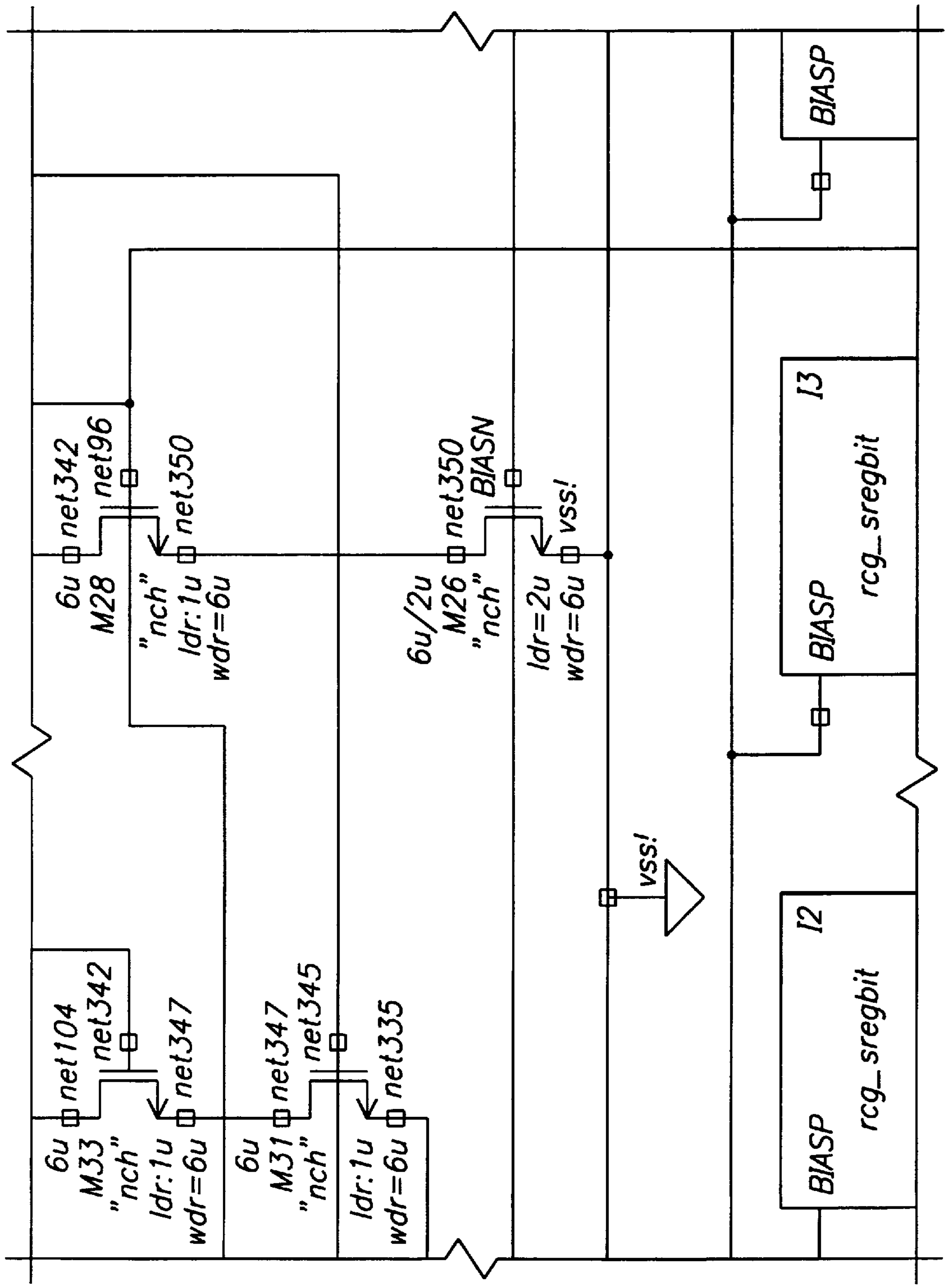
Fig 9.0901BB

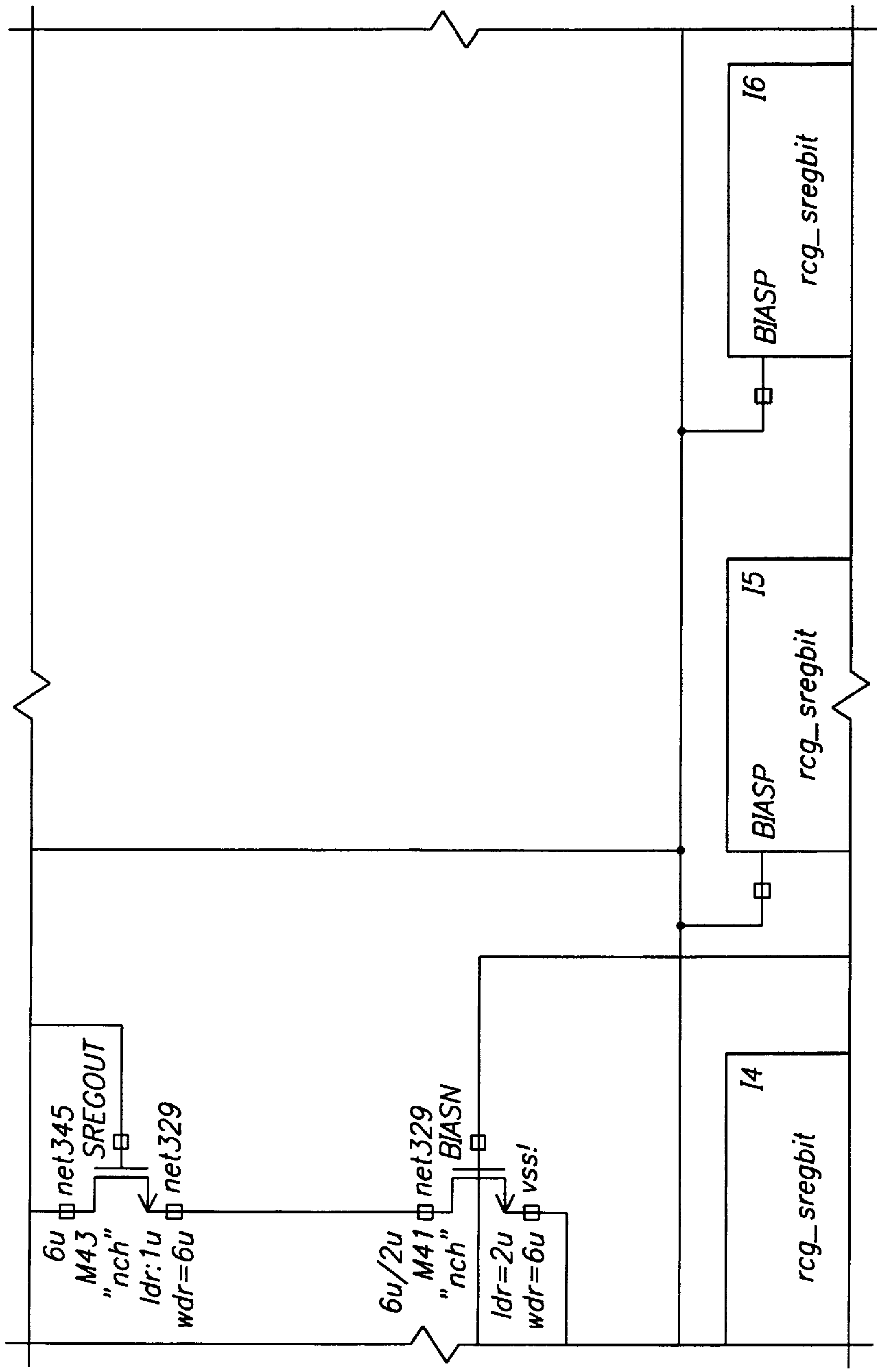
FIG. 9.0901BC

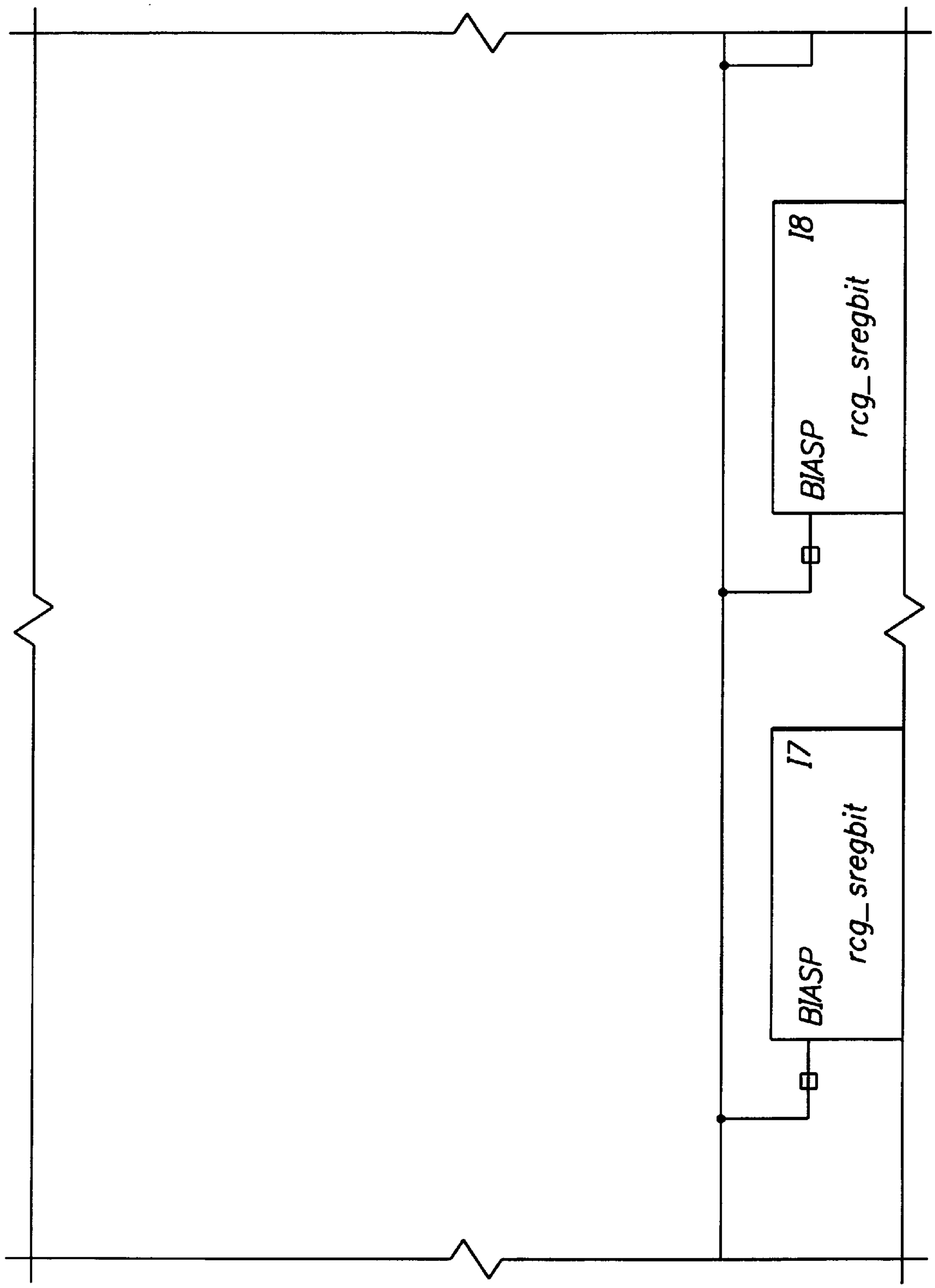
Fig. 9.0901BD

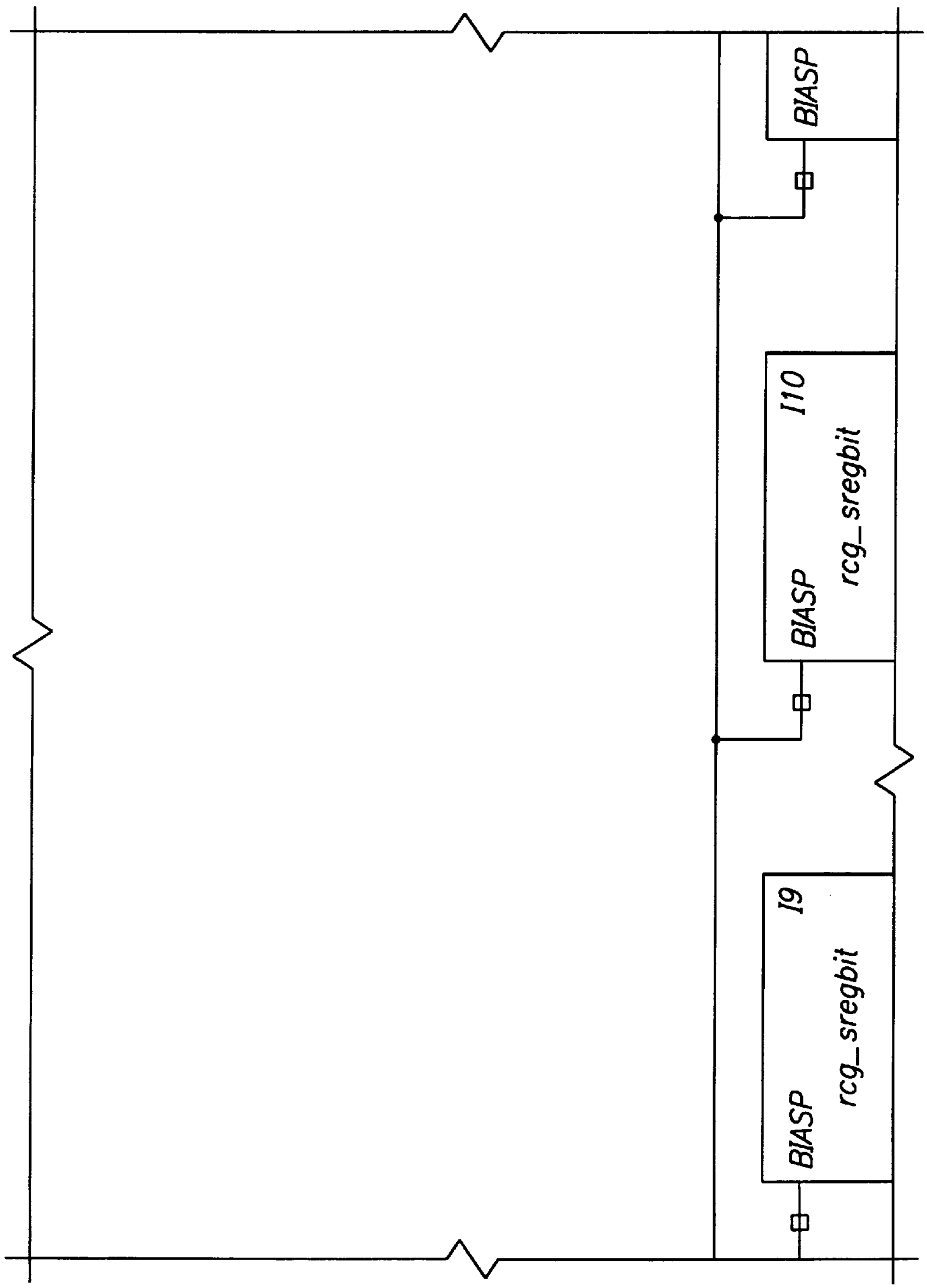
FIG. 9.090IIE

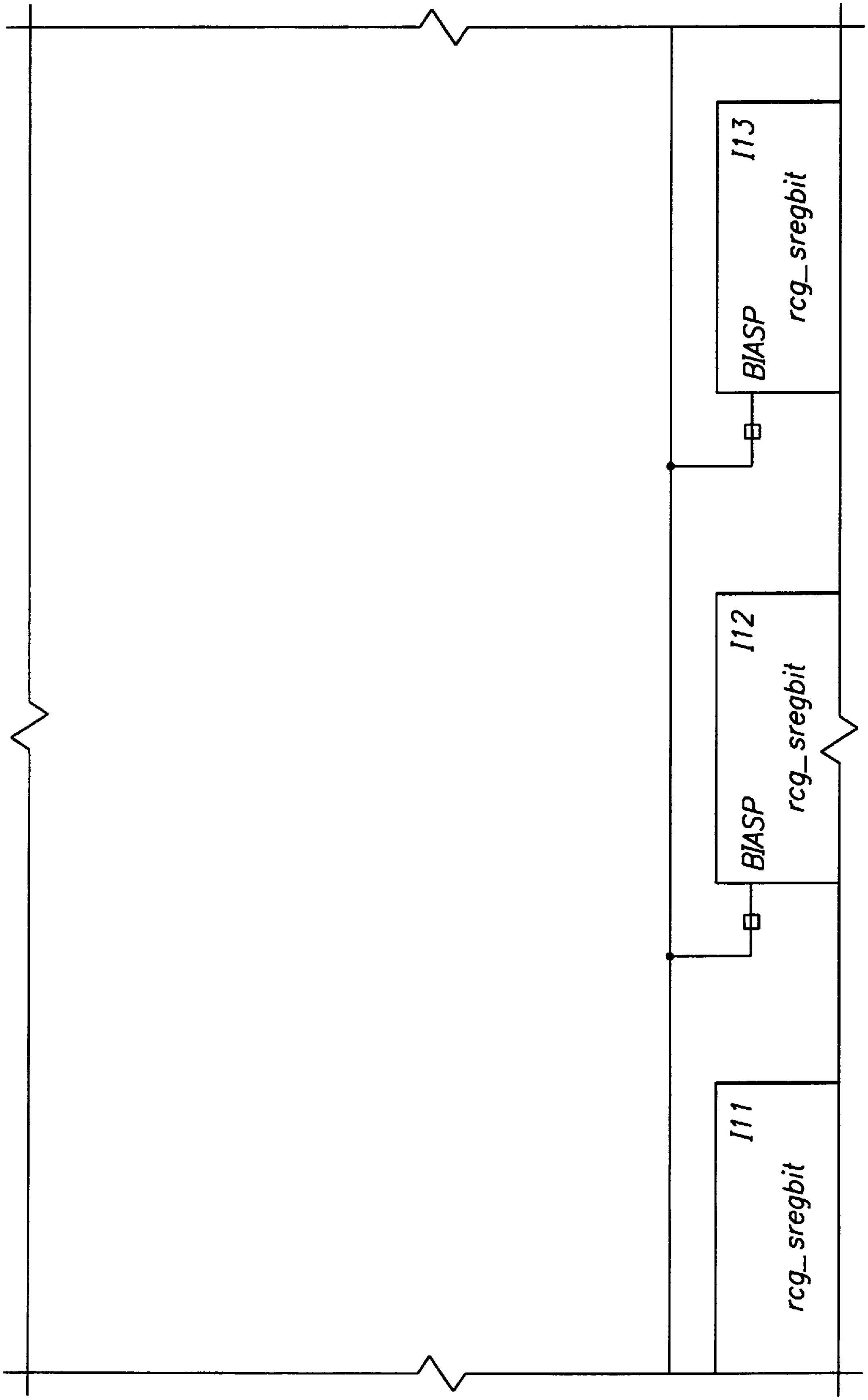
Fig. 9.0901BF

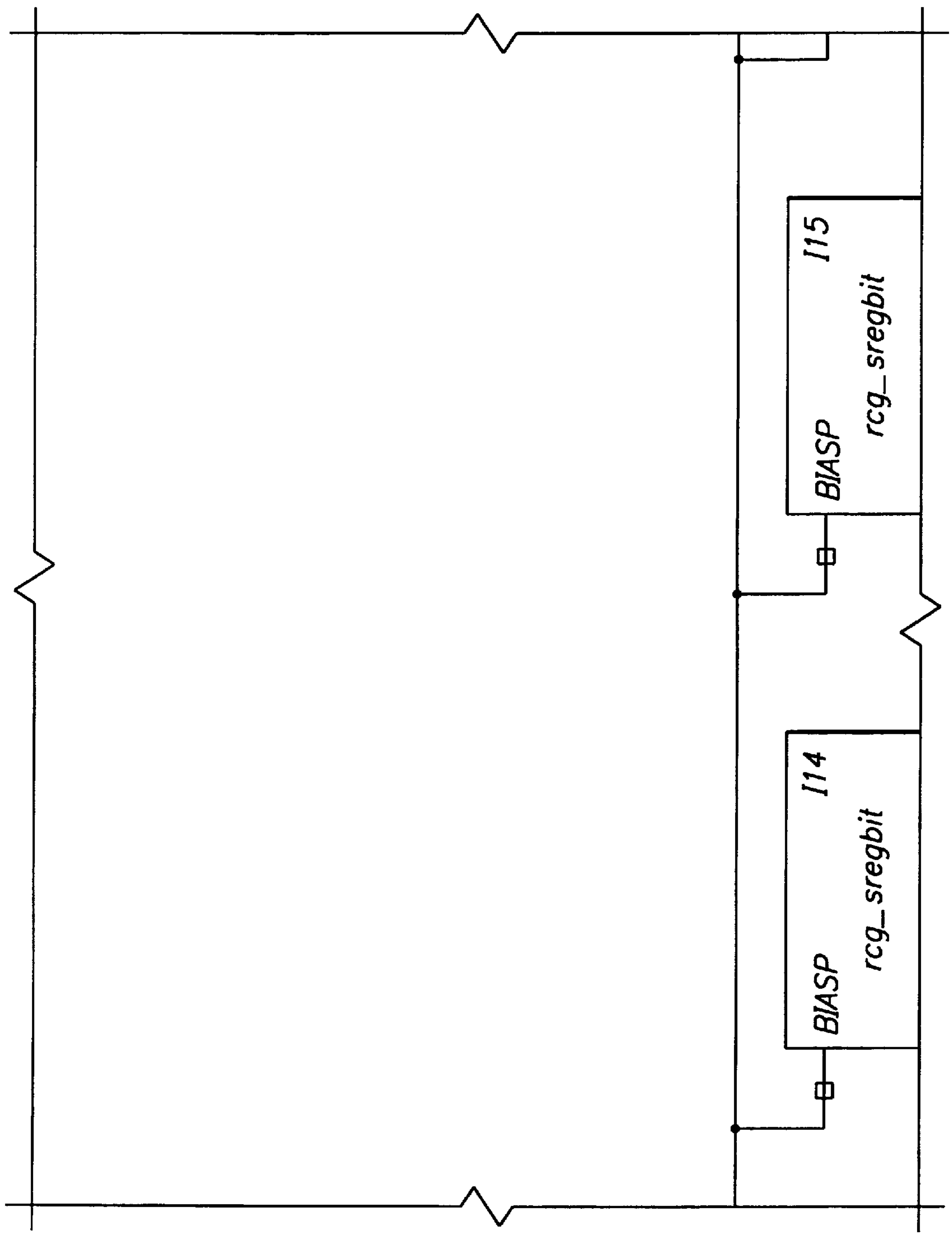
Fig 9.090IIBG

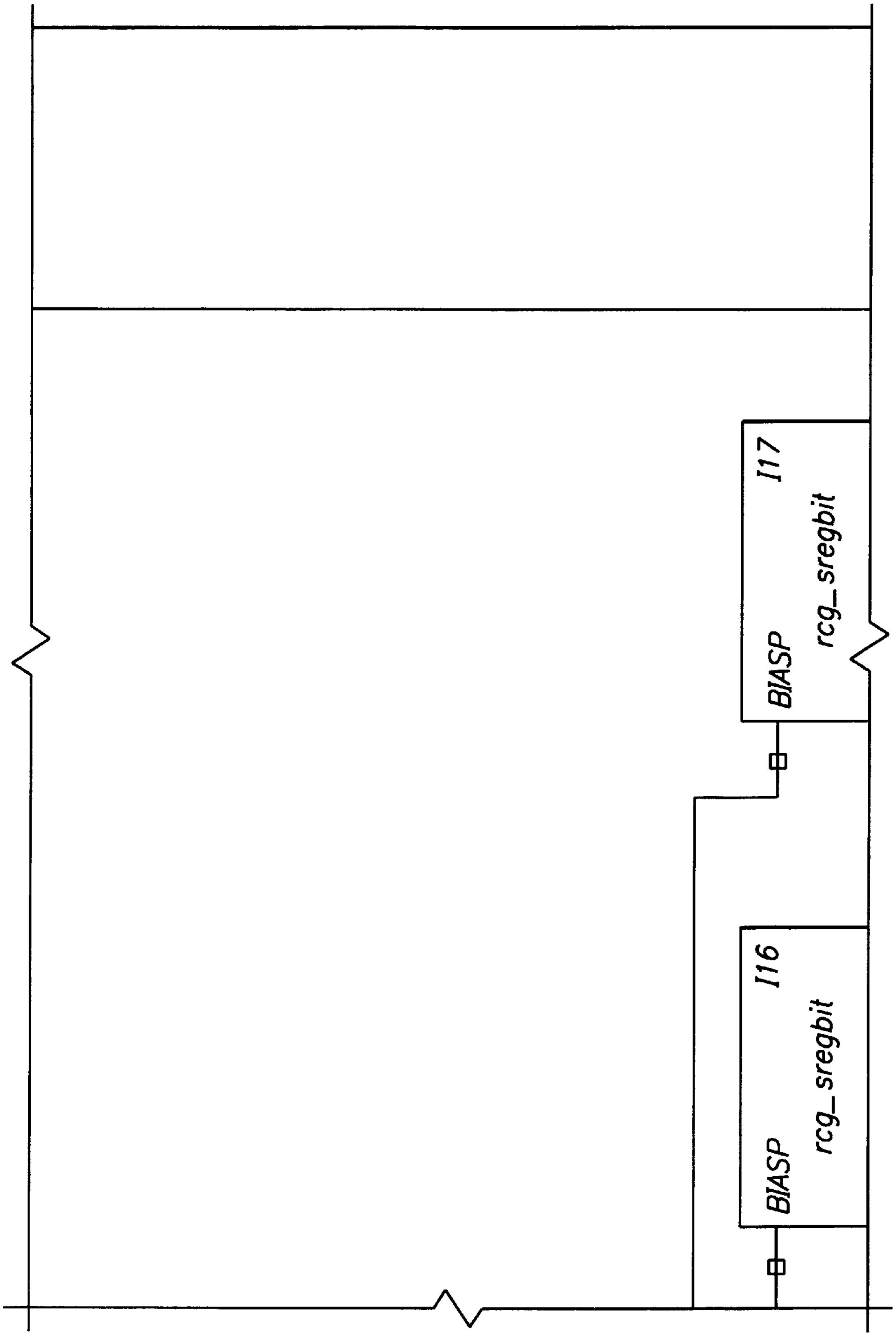
Fig. 9.0501BH

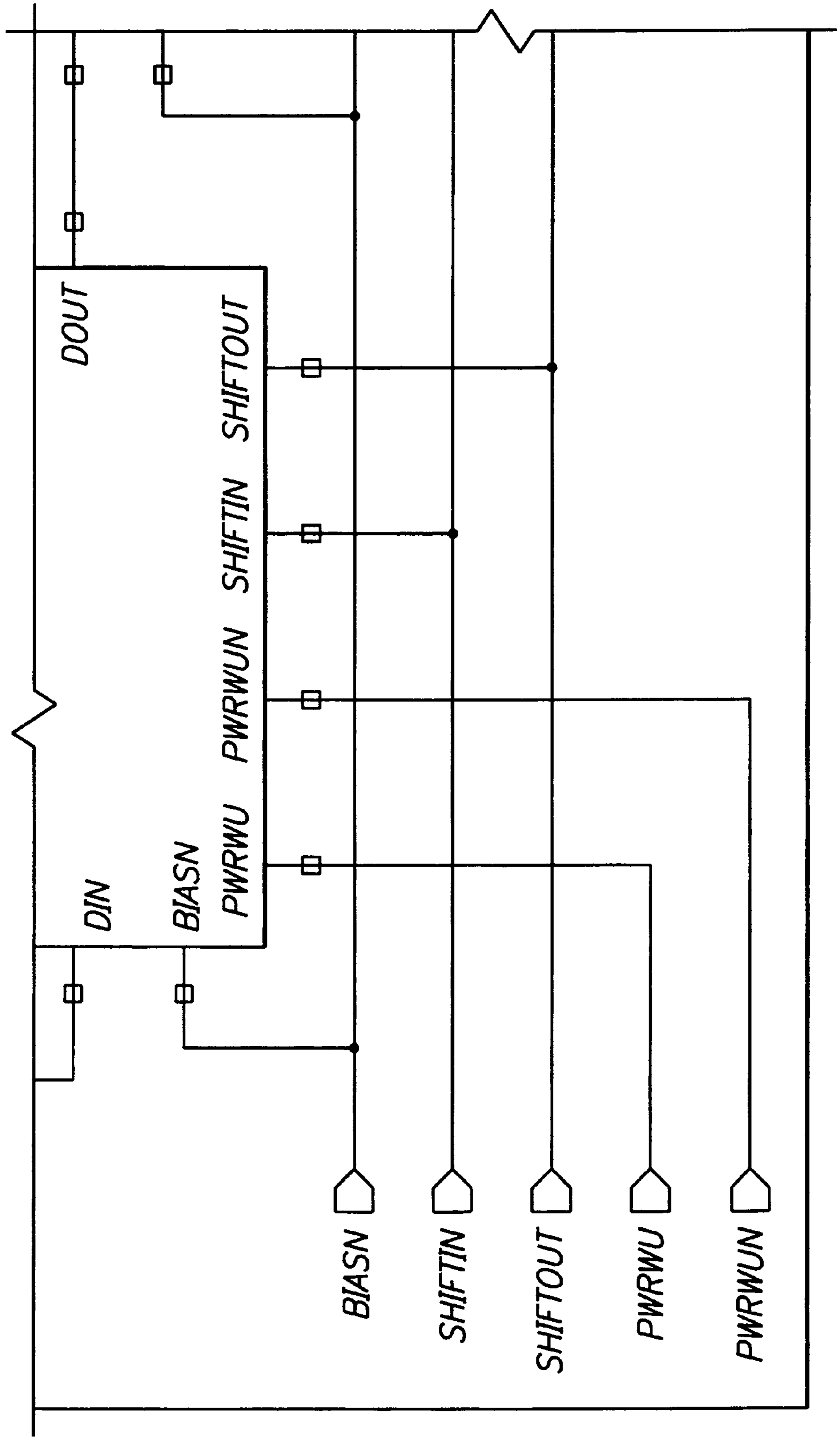
FIG. 9.0901CA

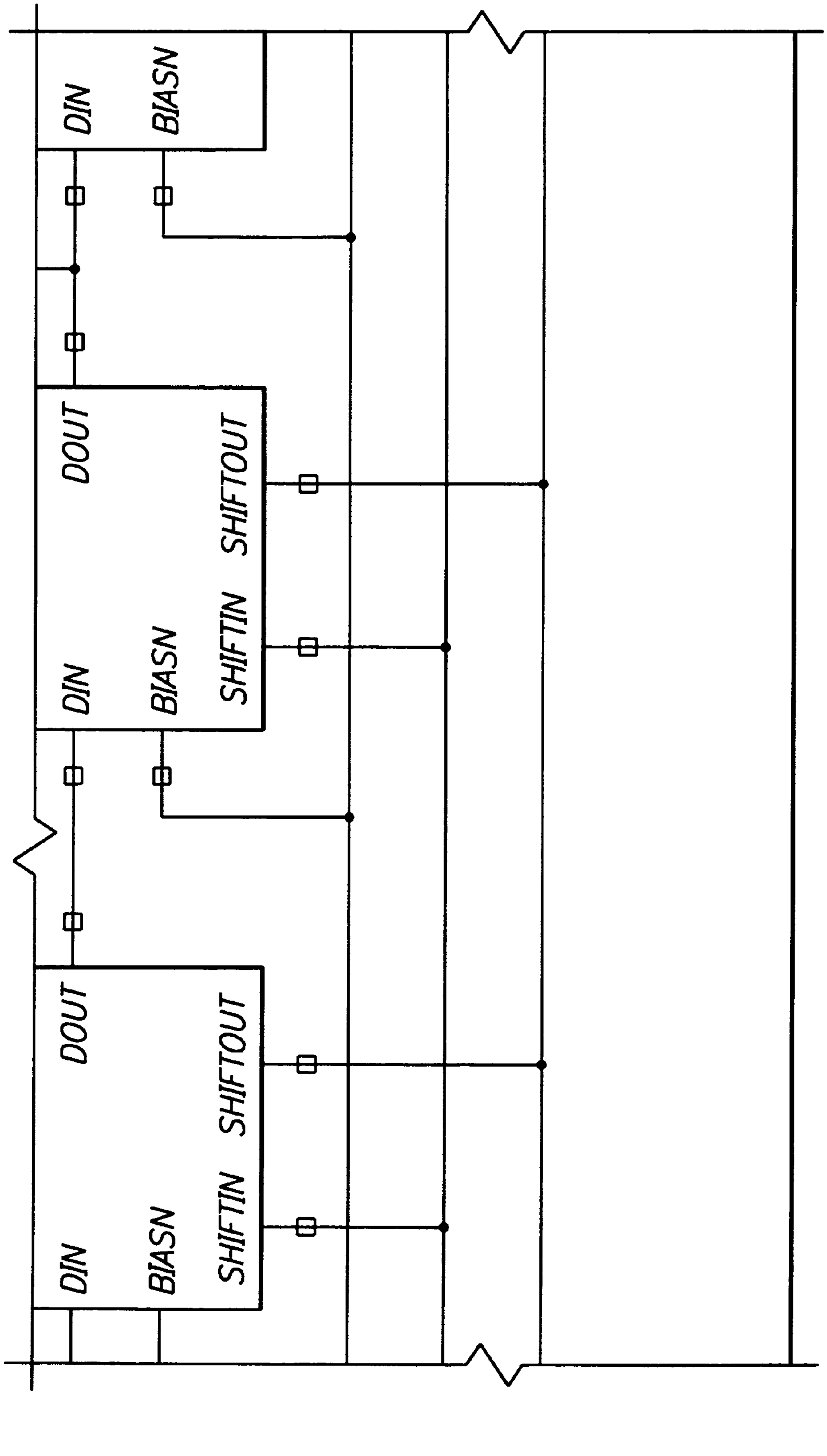
FIG. 9.0901CB

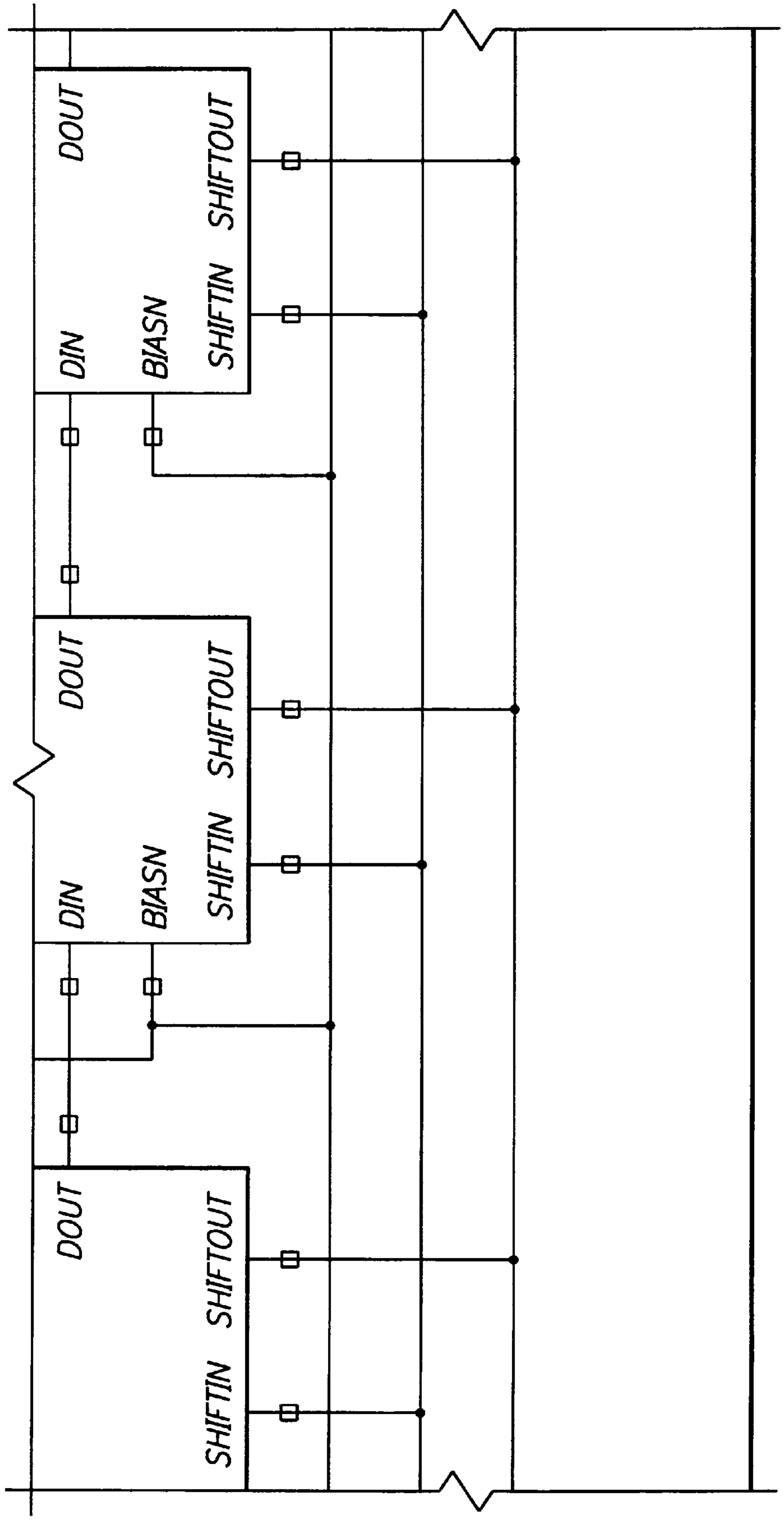
FIG. 9.060ICC

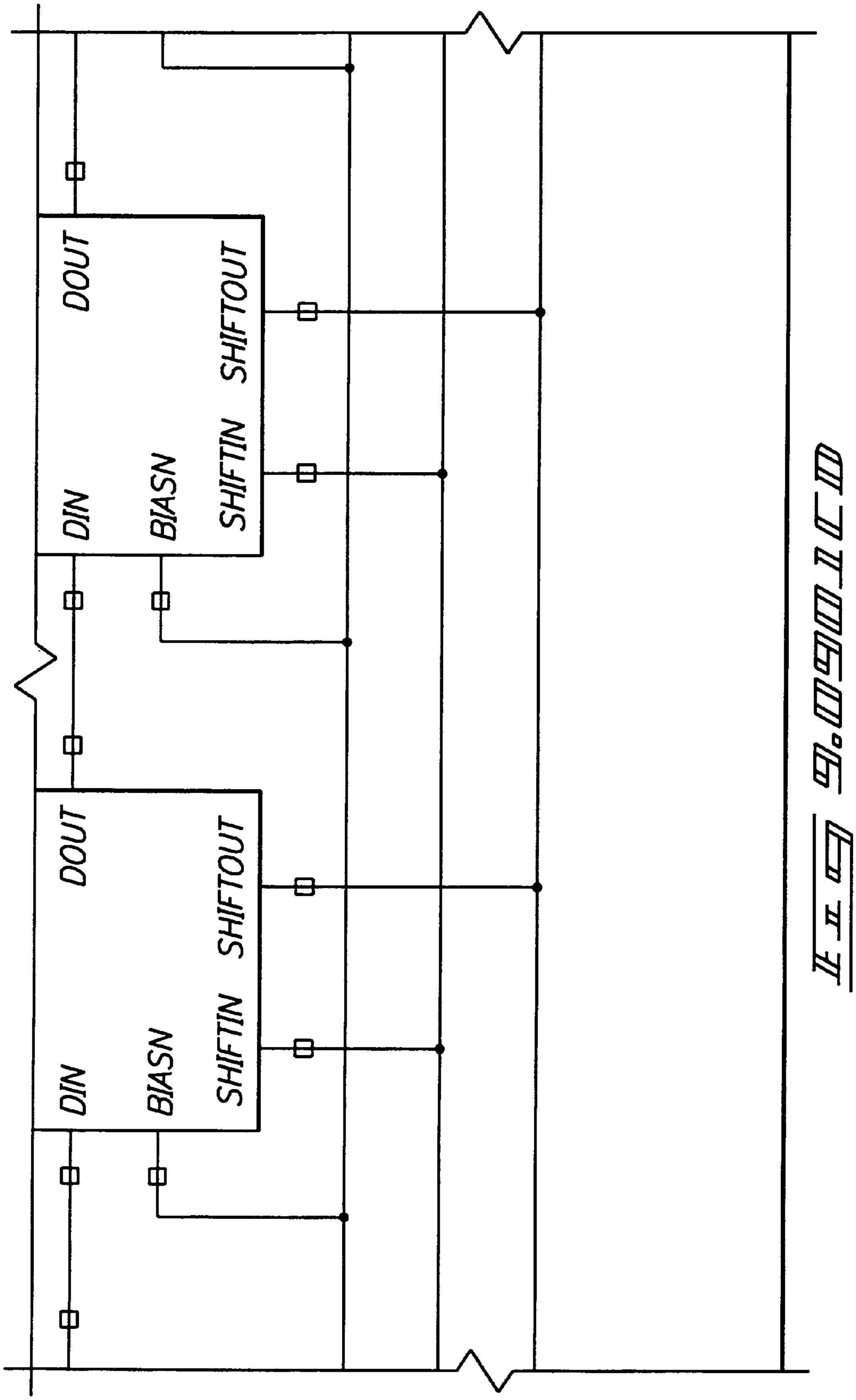
Fig. 9,060ICD

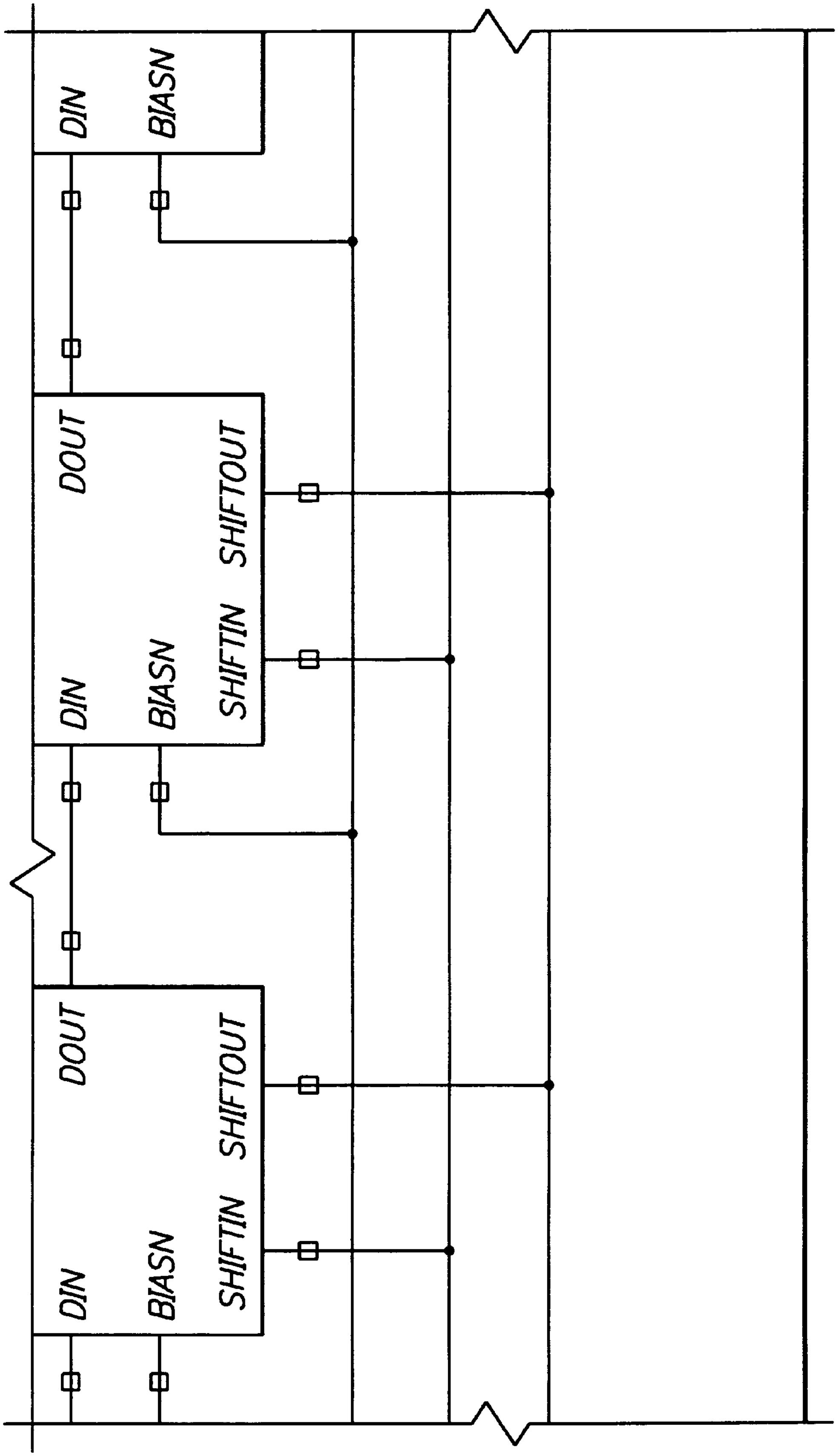
Fig. 9.090ICE

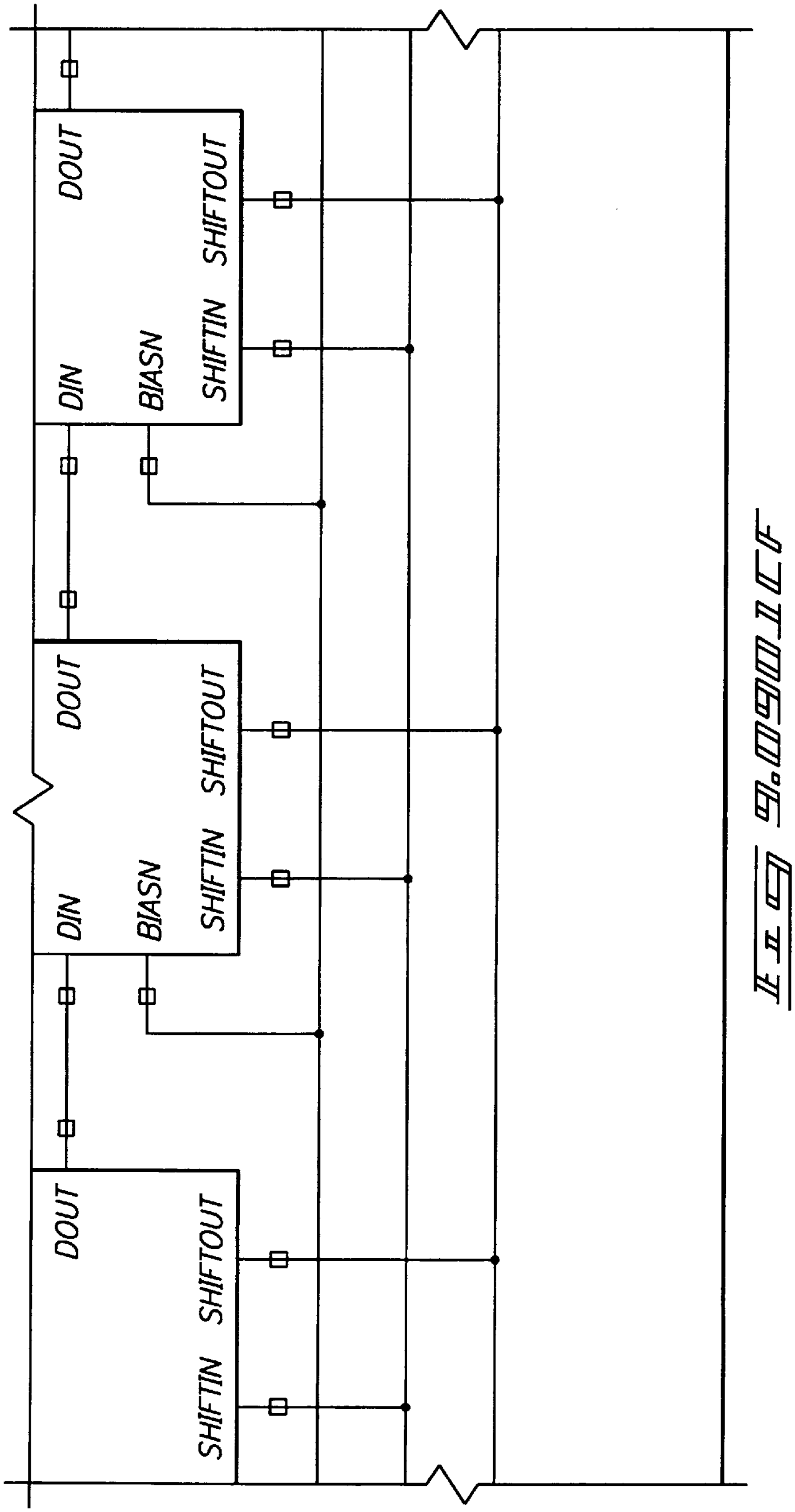
Fig. 9.0901CF

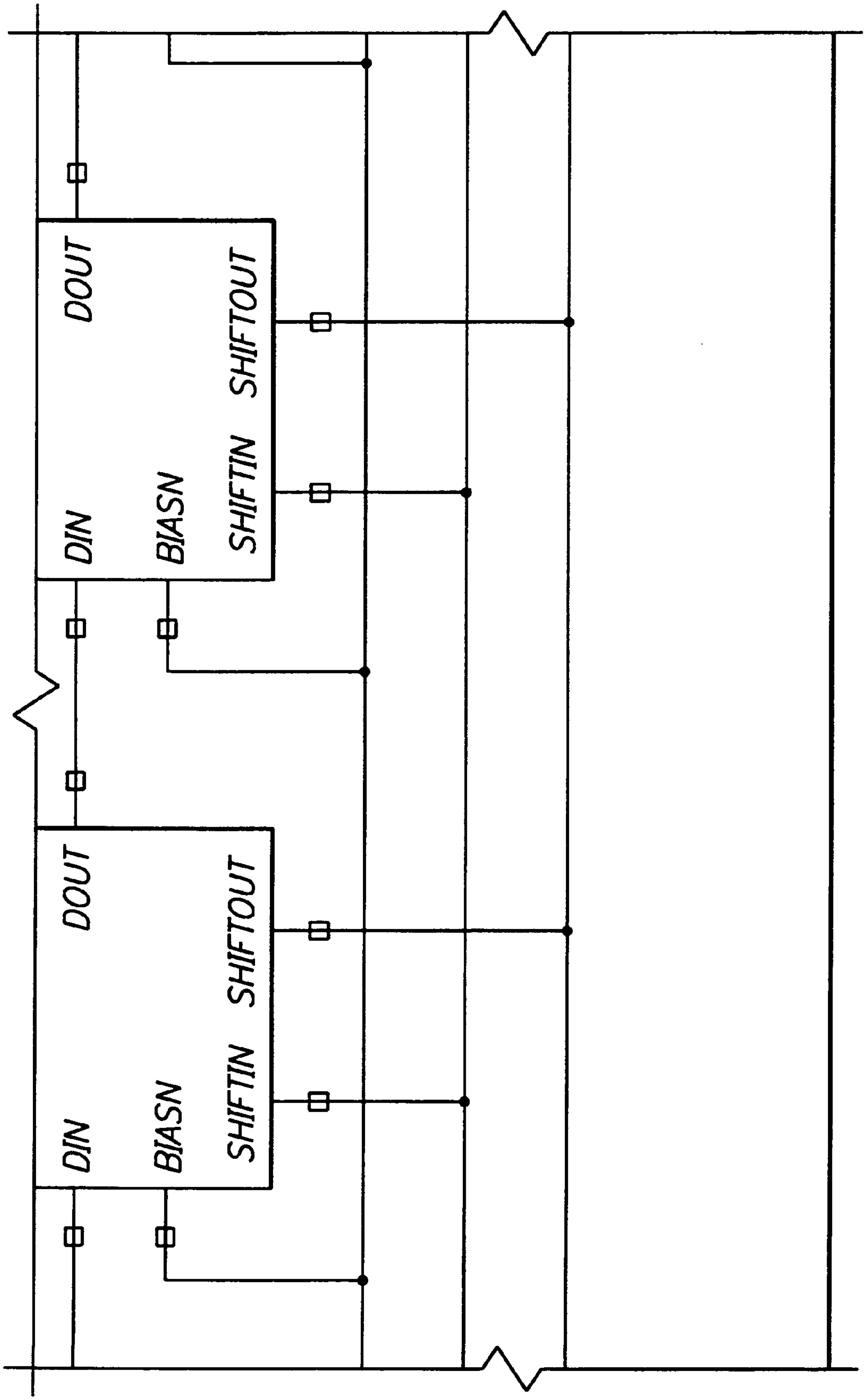
FIG. 9.090ICG

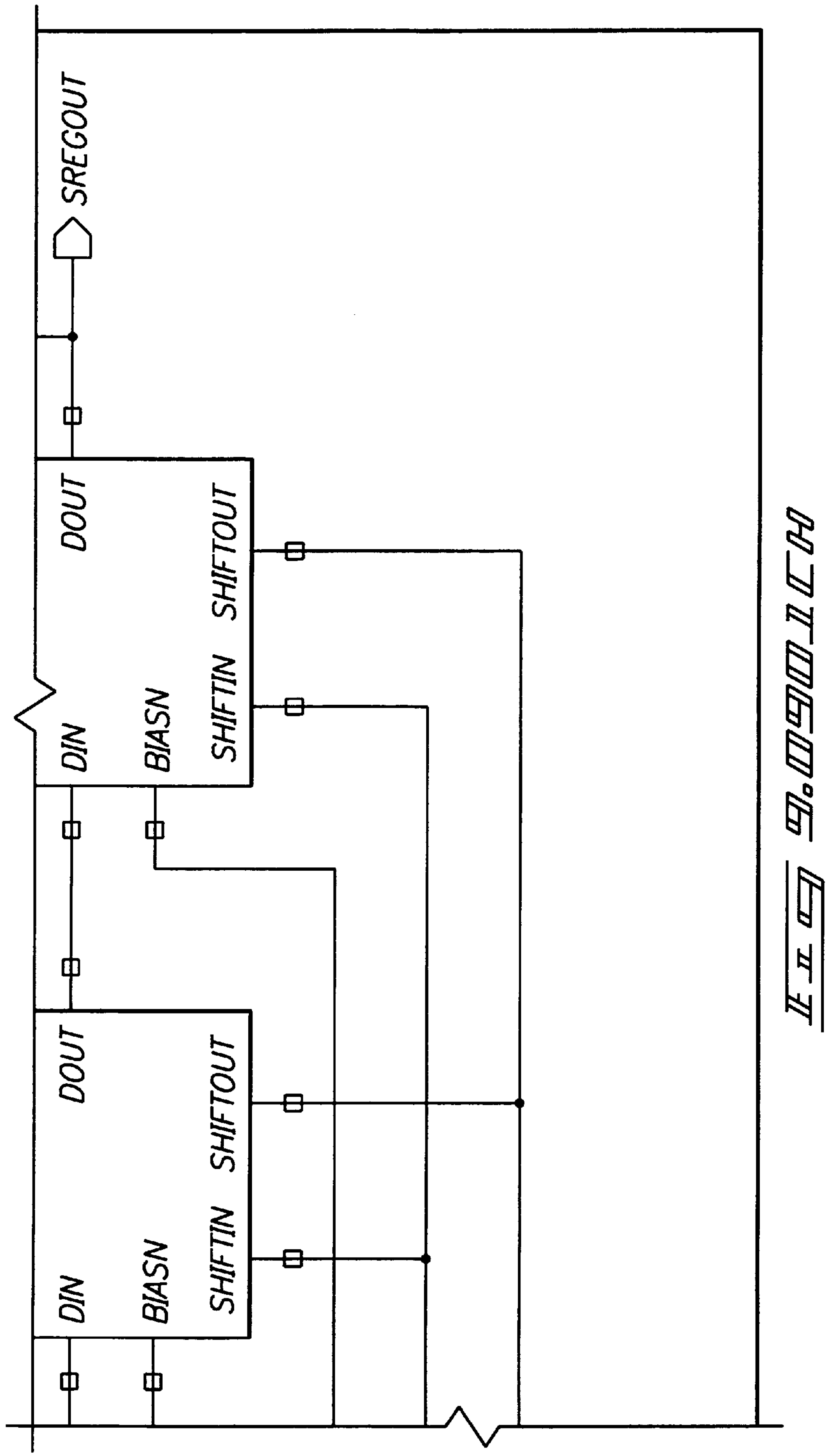
Fig. 9.060.1CH

| | | |
|---|---|---|
| 9.090101AA | 9.090101AB | 9.090101AC |
| 9.090101BA | 9.090101BB | 9.090101BC |
| 9.090101CA | 9.090101CB | 9.090101CC |

FIG. 9.090101

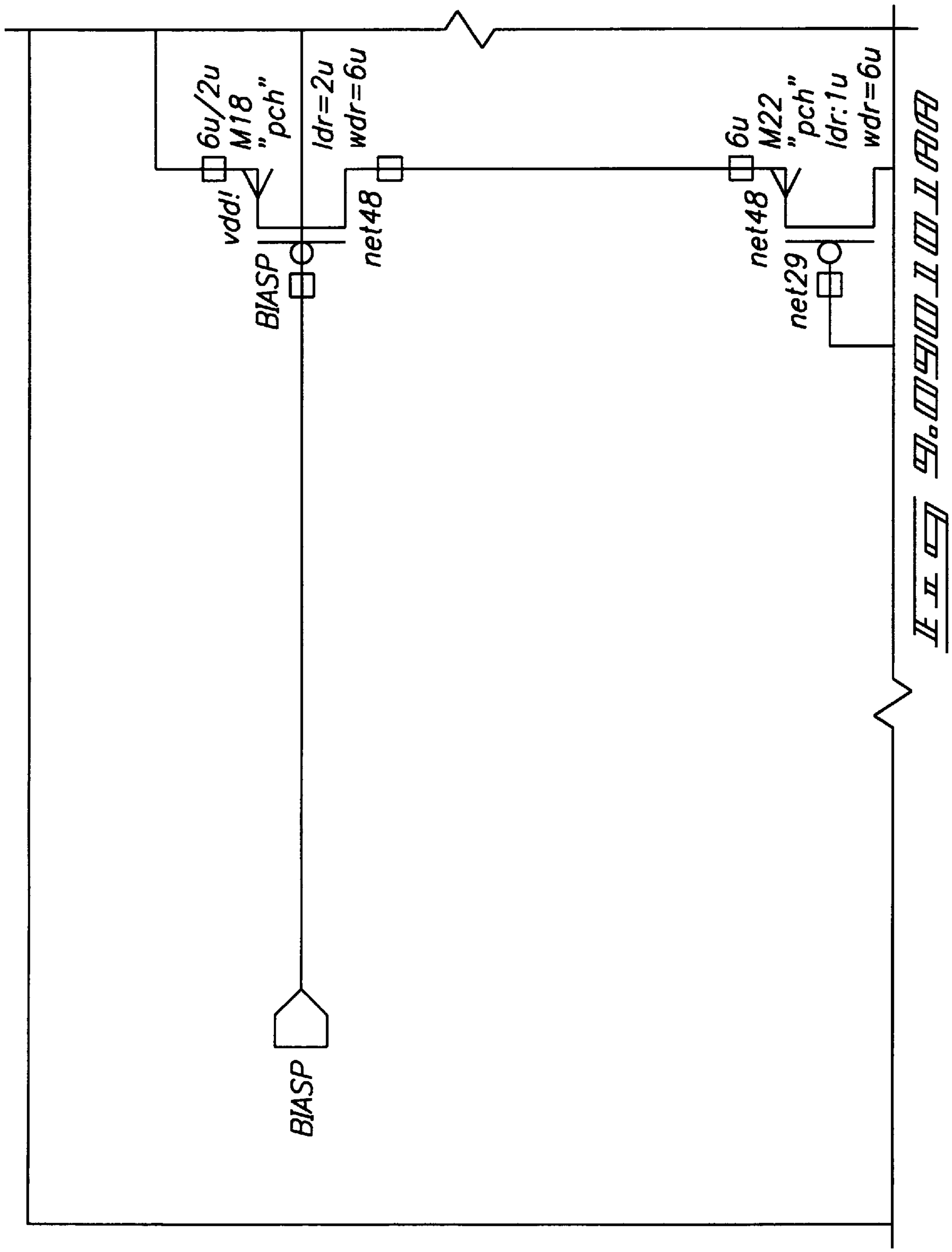
FIG. 9.090101AA

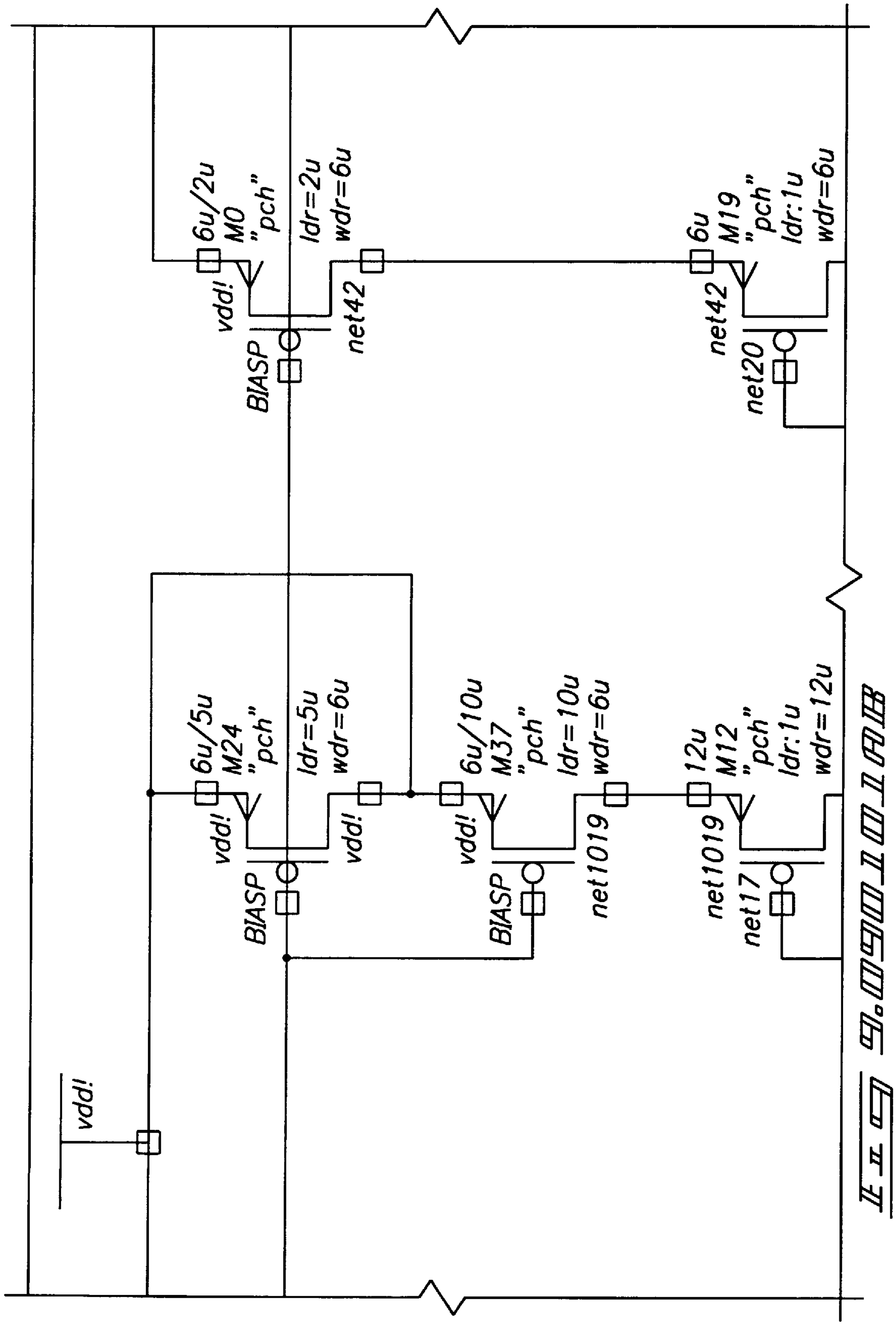
FIG. 9.090101AB

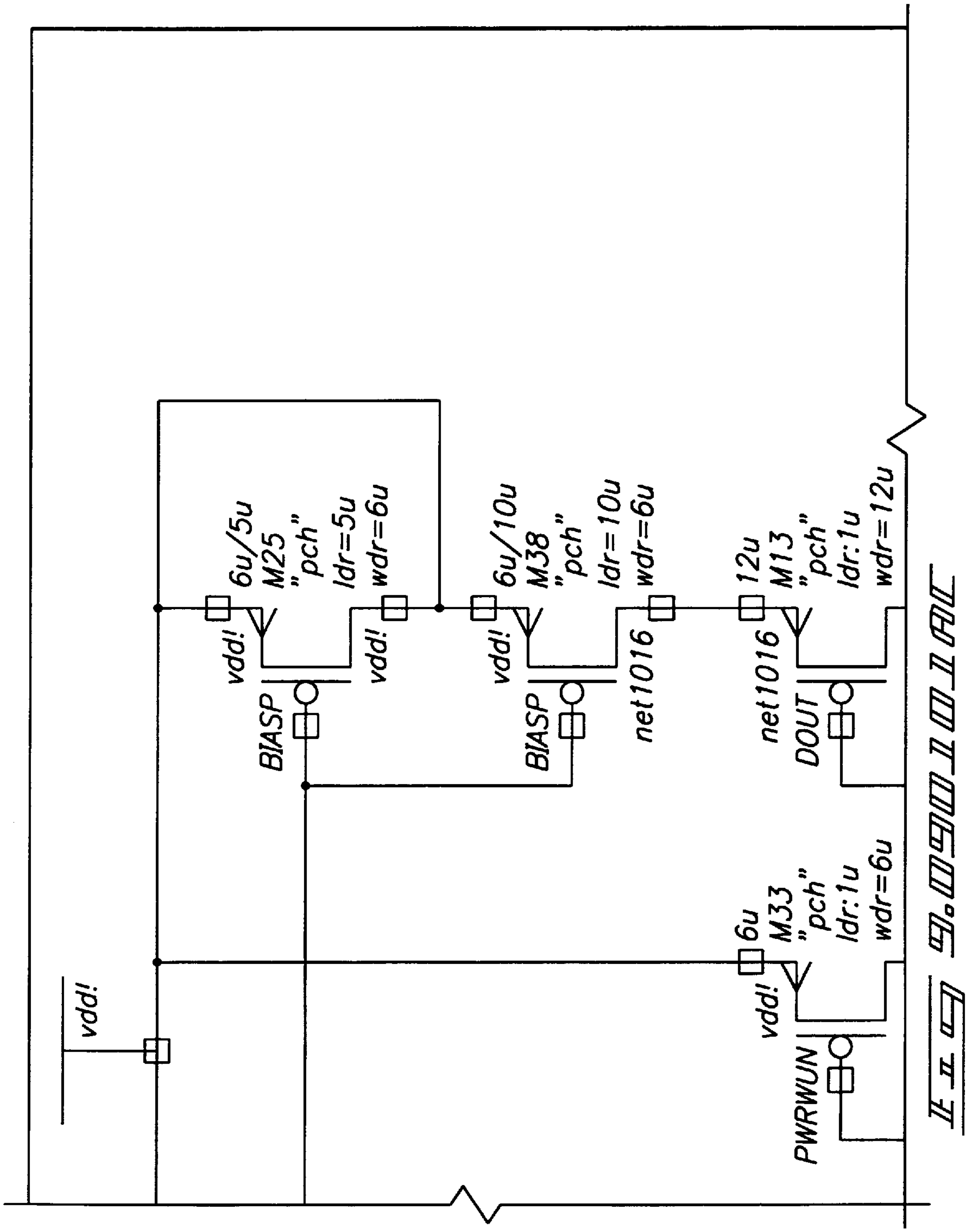
FIG. 9.090101AC

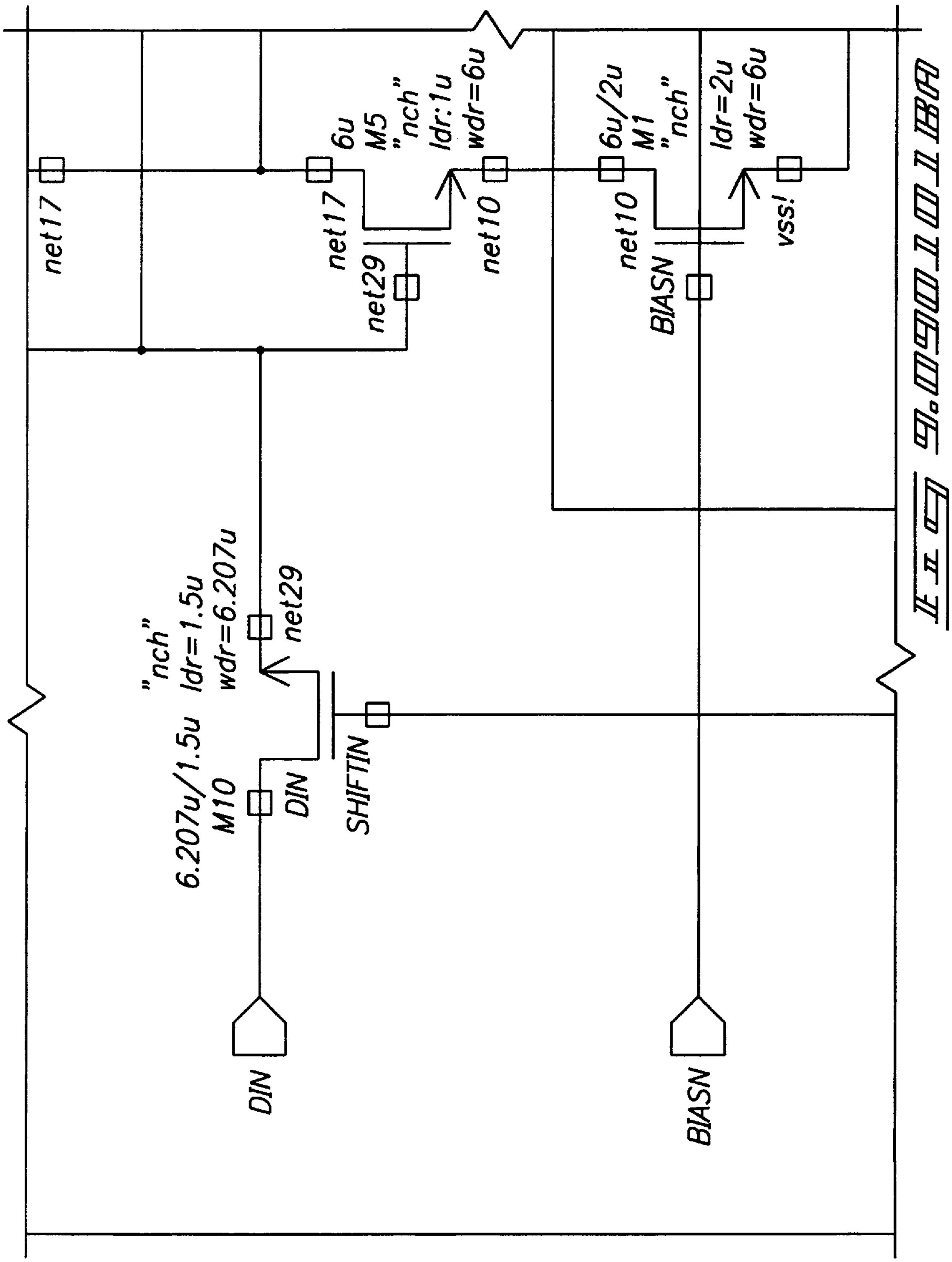
FIG. 9.090101BA

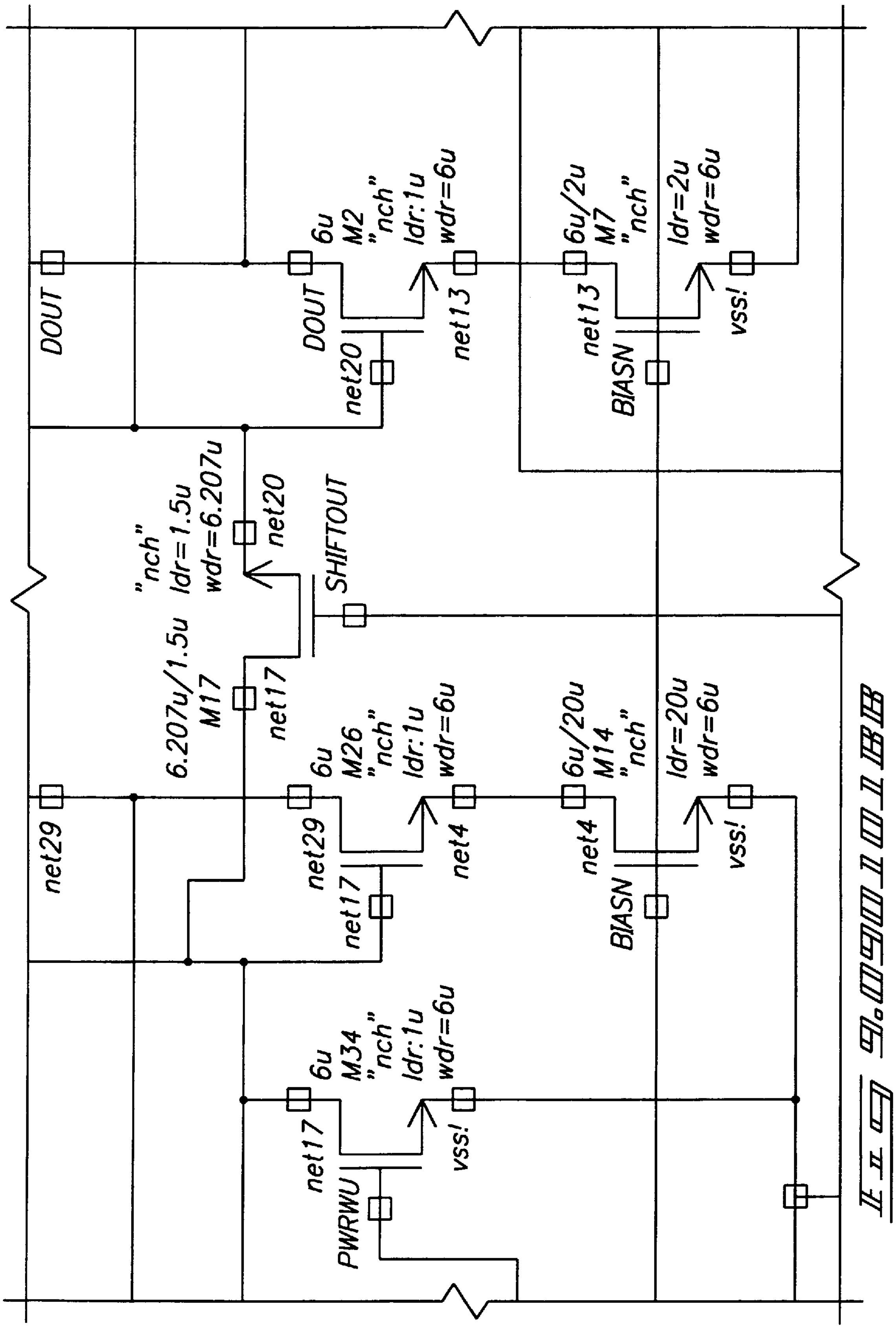
FIG. 9.09101B

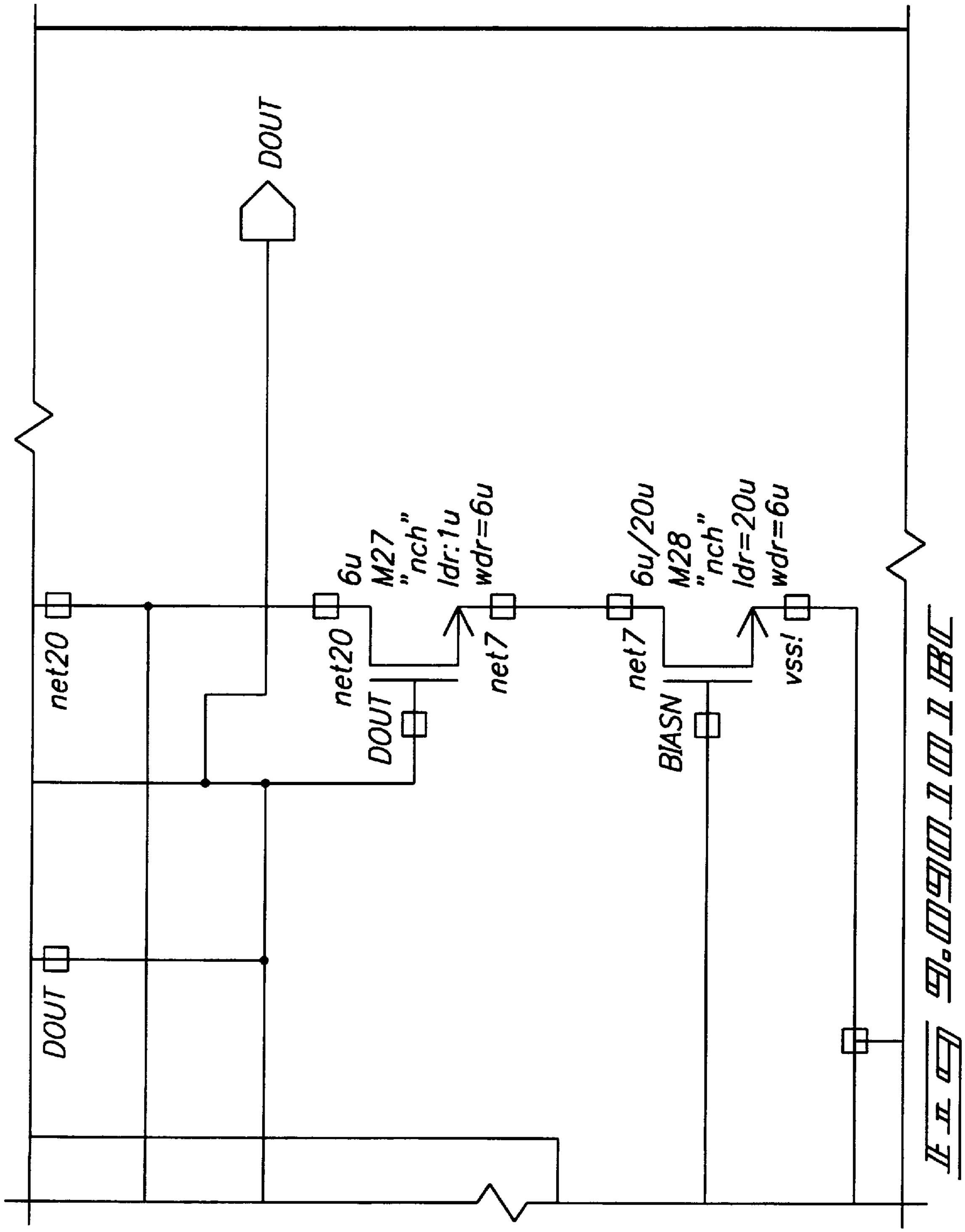
Fig. 9.090101BC

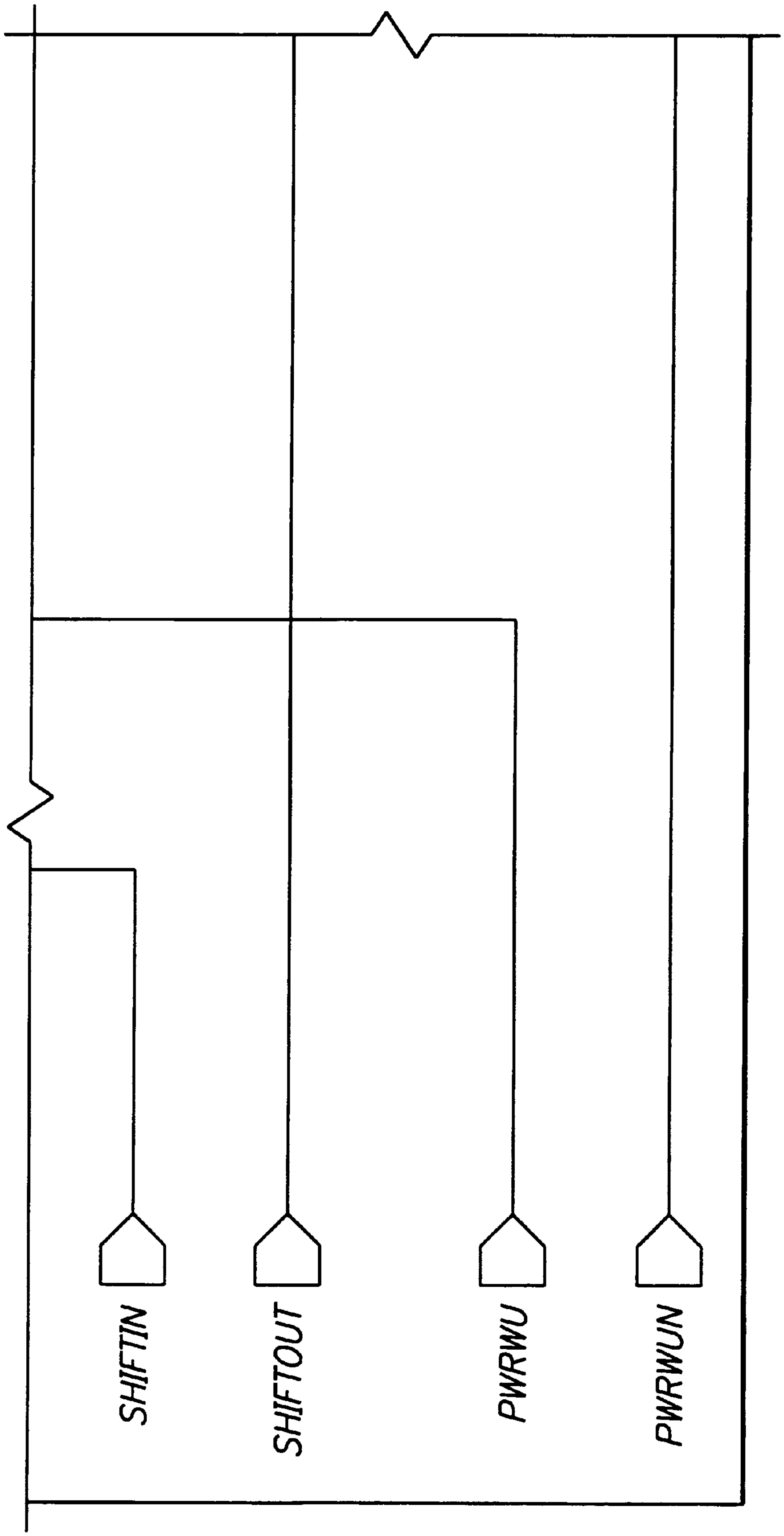
Fig. 9.060101CA

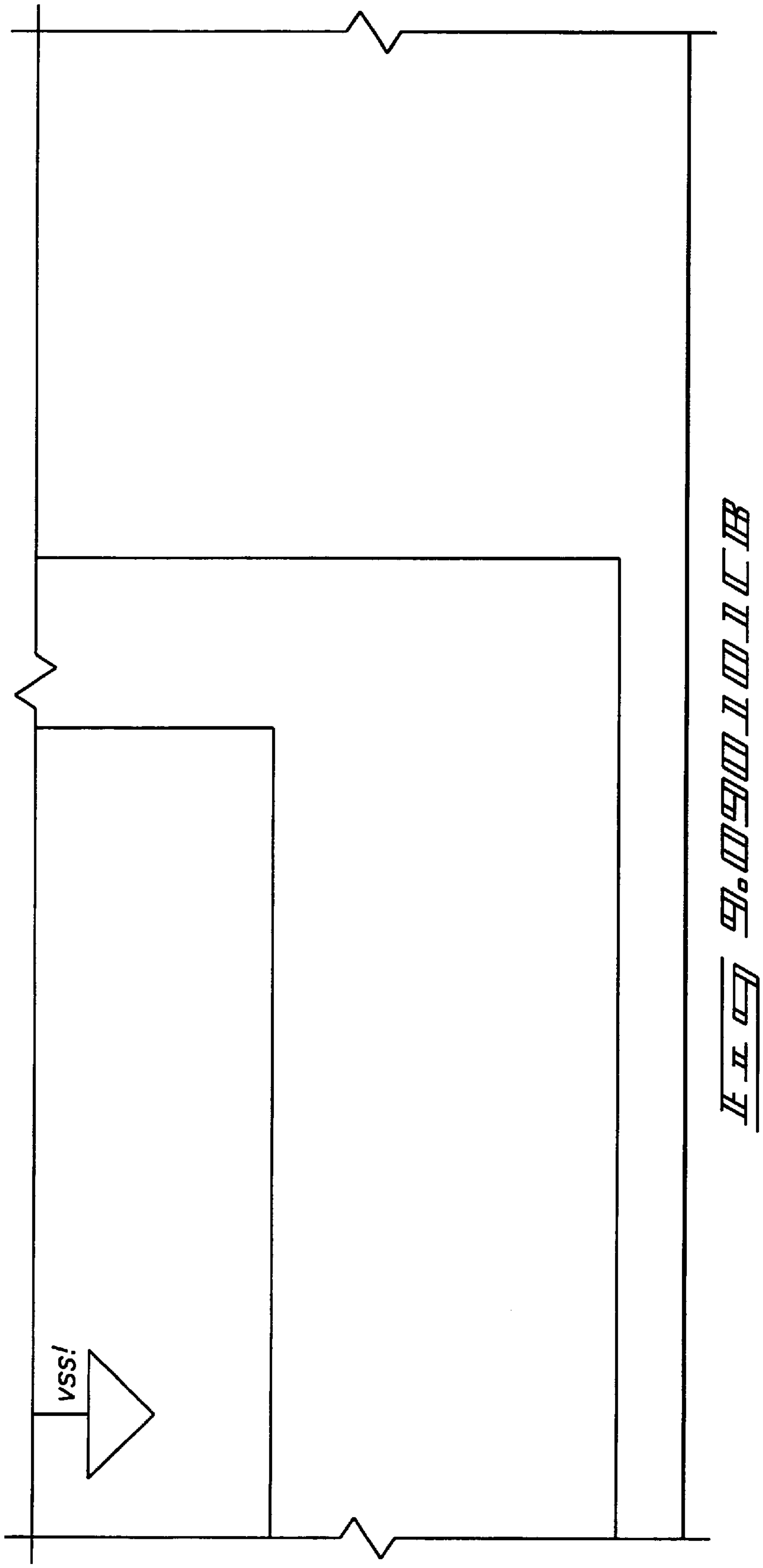
Fig 9.090101CB

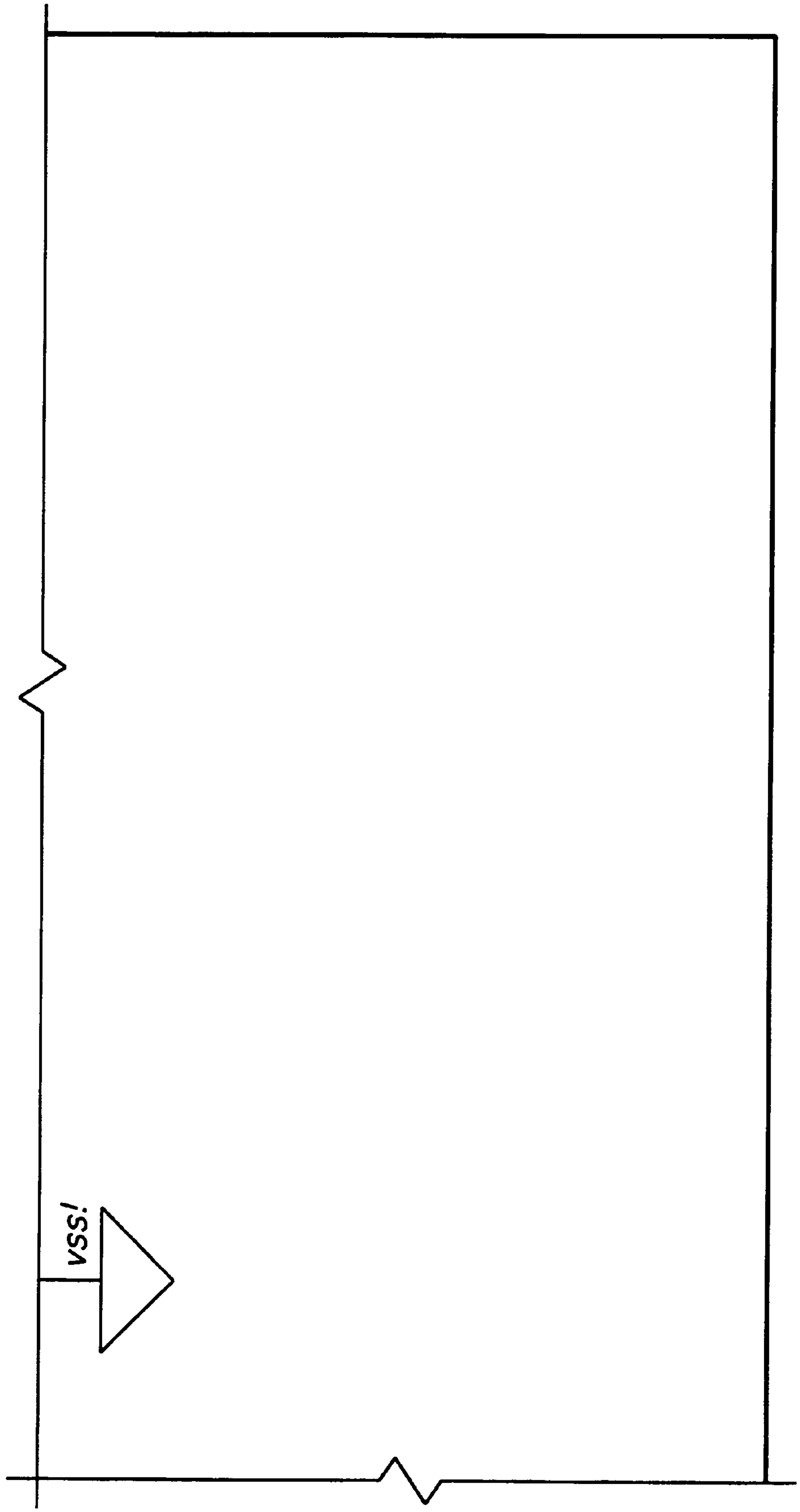
Fig. 9.090101CC

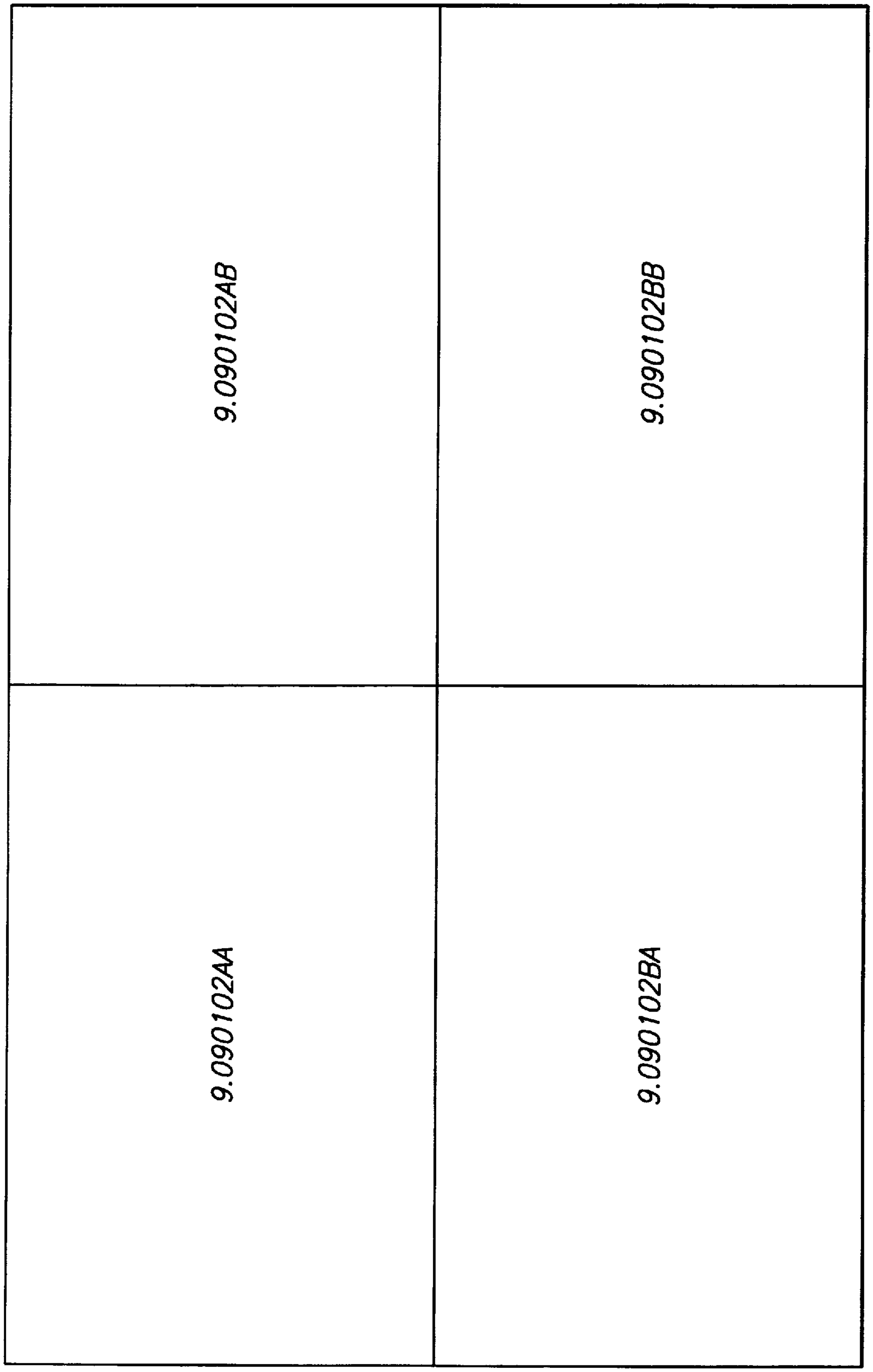
FIG. 9.090102

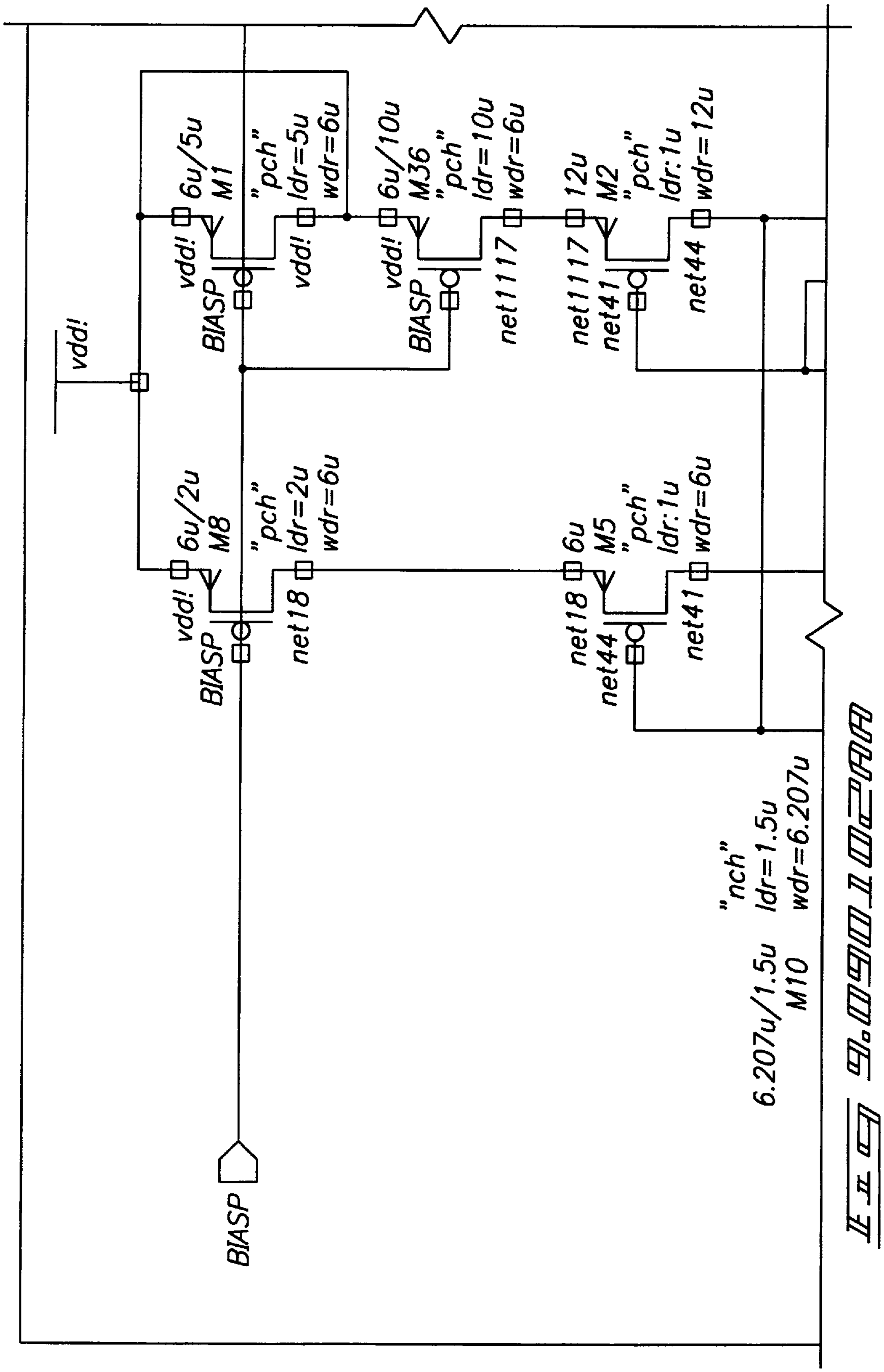
Fig. 9.09010.2AA

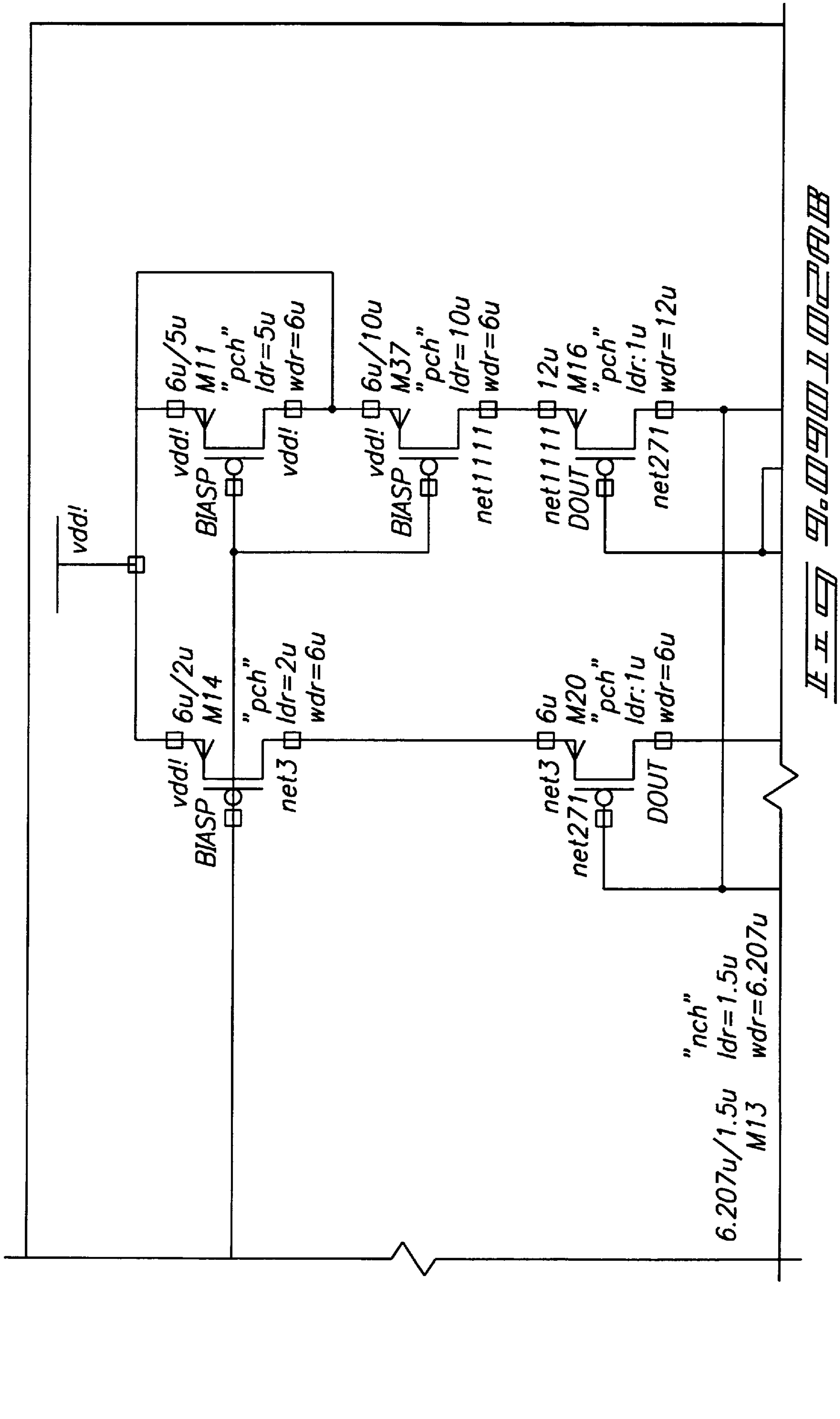
Fig. 9.090102AB

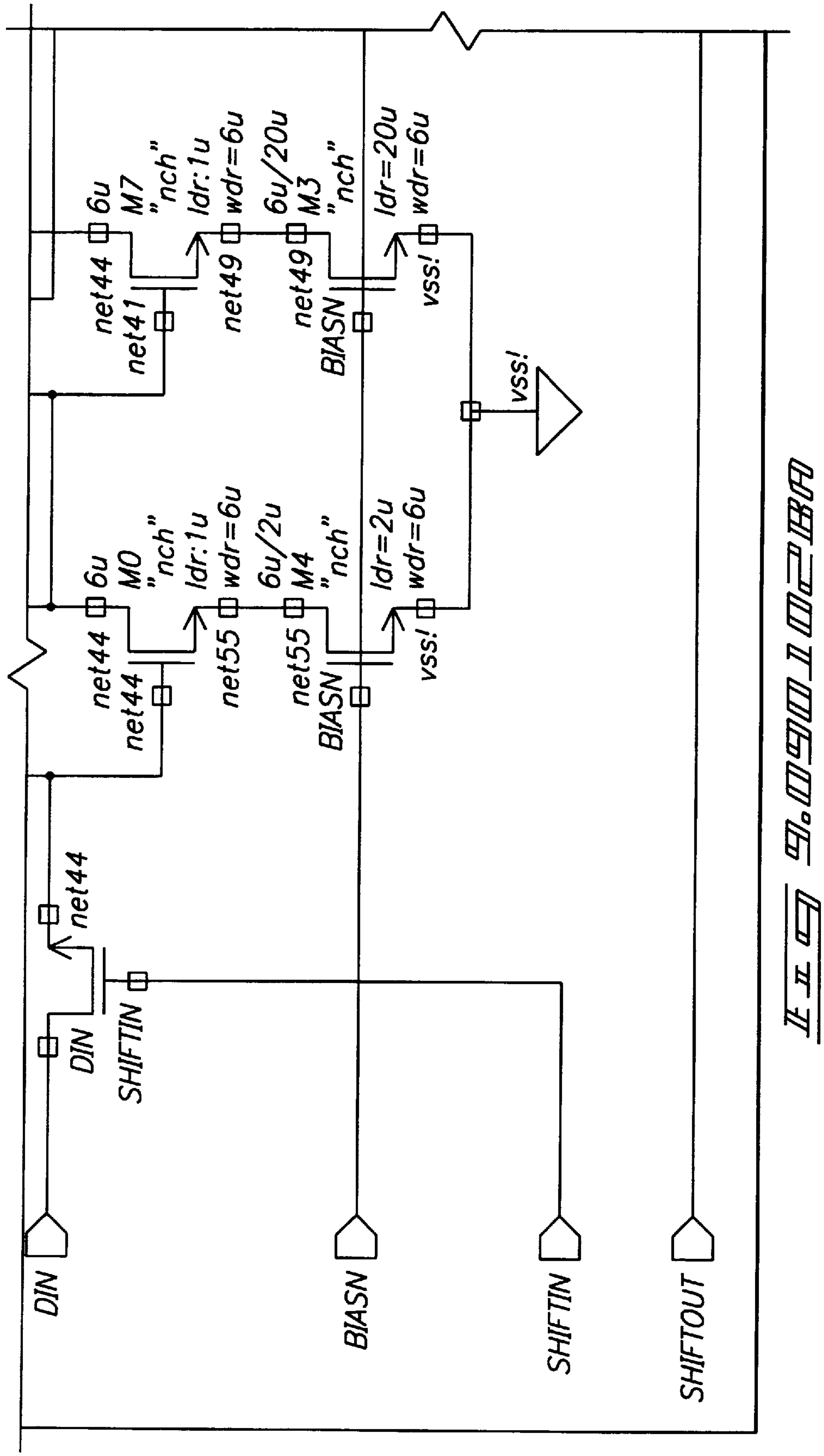
FIG. 9.0910.2BA

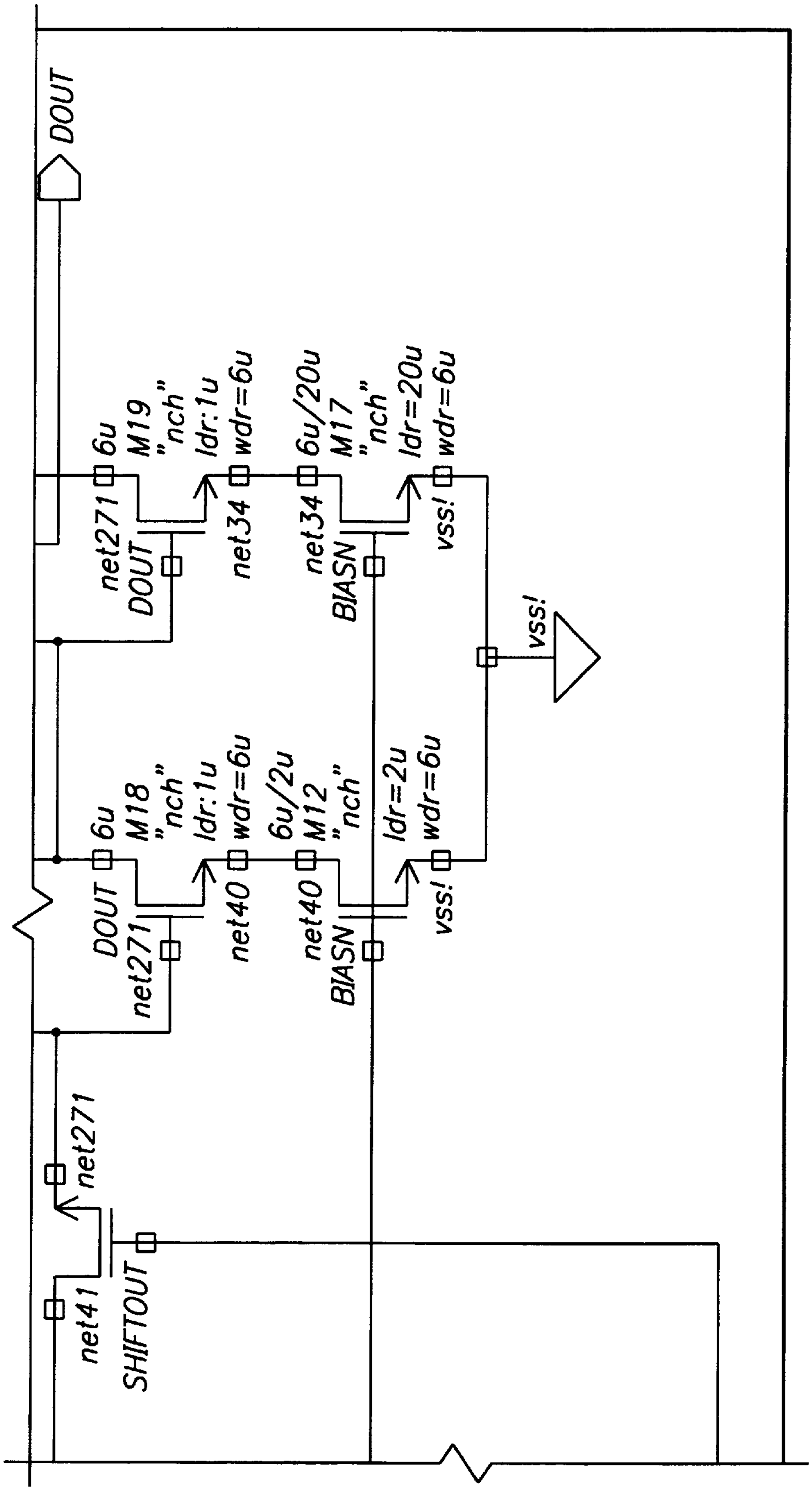
FIG. 9.0901.02B

| | | | | | | | | | | | |
|---|---|---|---|---|---|---|---|---|---|---|---|
| 9.0902AA | 9.0902AB | 9.0902AC | 9.0902AD | 9.0902AE | 9.0902AF | 9.0902AG | 9.0902AH | 9.0902AI | 9.0902AJ | 9.0902AK | 9.0902AL |
| 9.0902BA | 9.0902BB | 9.0902BC | 9.0902BD | 9.0902BE | 9.0902BF | 9.0902BG | 9.0902BH | 9.0902BI | 9.0902BJ | 9.0902BK | 9.0902BL |
| | | 9.0902CC | | 9.0902CE | 9.0902CF | 9.0902CG | 9.0902CH | 9.0902CI | 9.0902CJ | 9.0902CK | 9.0902CL |
| | | 9.0902DC | 9.0902DD | 9.0902DE | 9.0902DF | | | | | | 9.0902DL |
| 9.0902EA | 9.0902EB | 9.0902EC | 9.0902ED | 9.0902EE | 9.0902EF | 9.0902EG | 9.0902EH | 9.0902EI | 9.0902EJ | 9.0902EK | 9.0902EL |
| | | | 9.0902FD | 9.0902FE | 9.0902FF | 9.0902FG | 9.0902FH | 9.0902FI | 9.0902FJ | 9.0902FK | 9.0902FL |

FIG. 9.0902

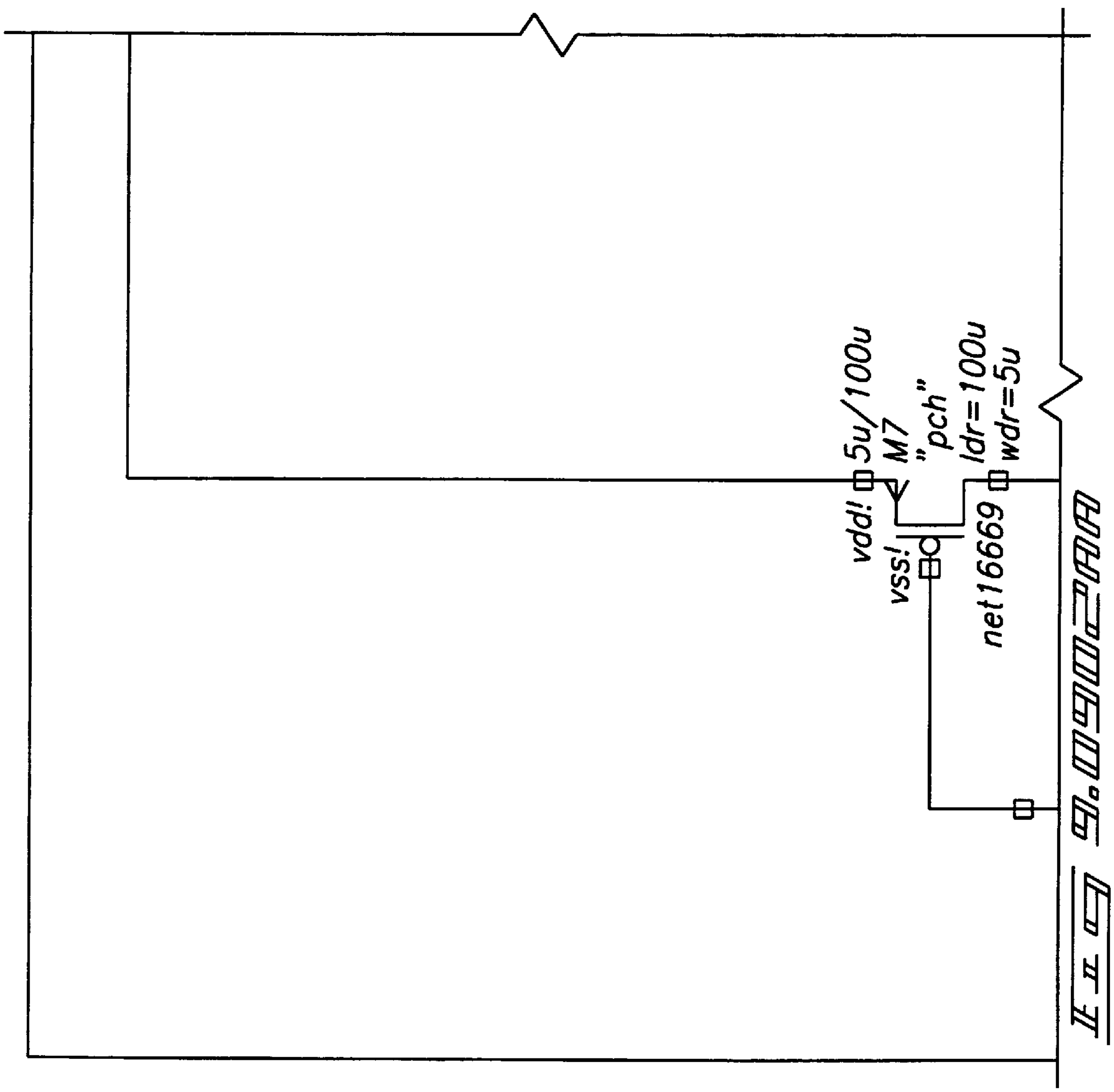
FIG. 9.0090.2AA

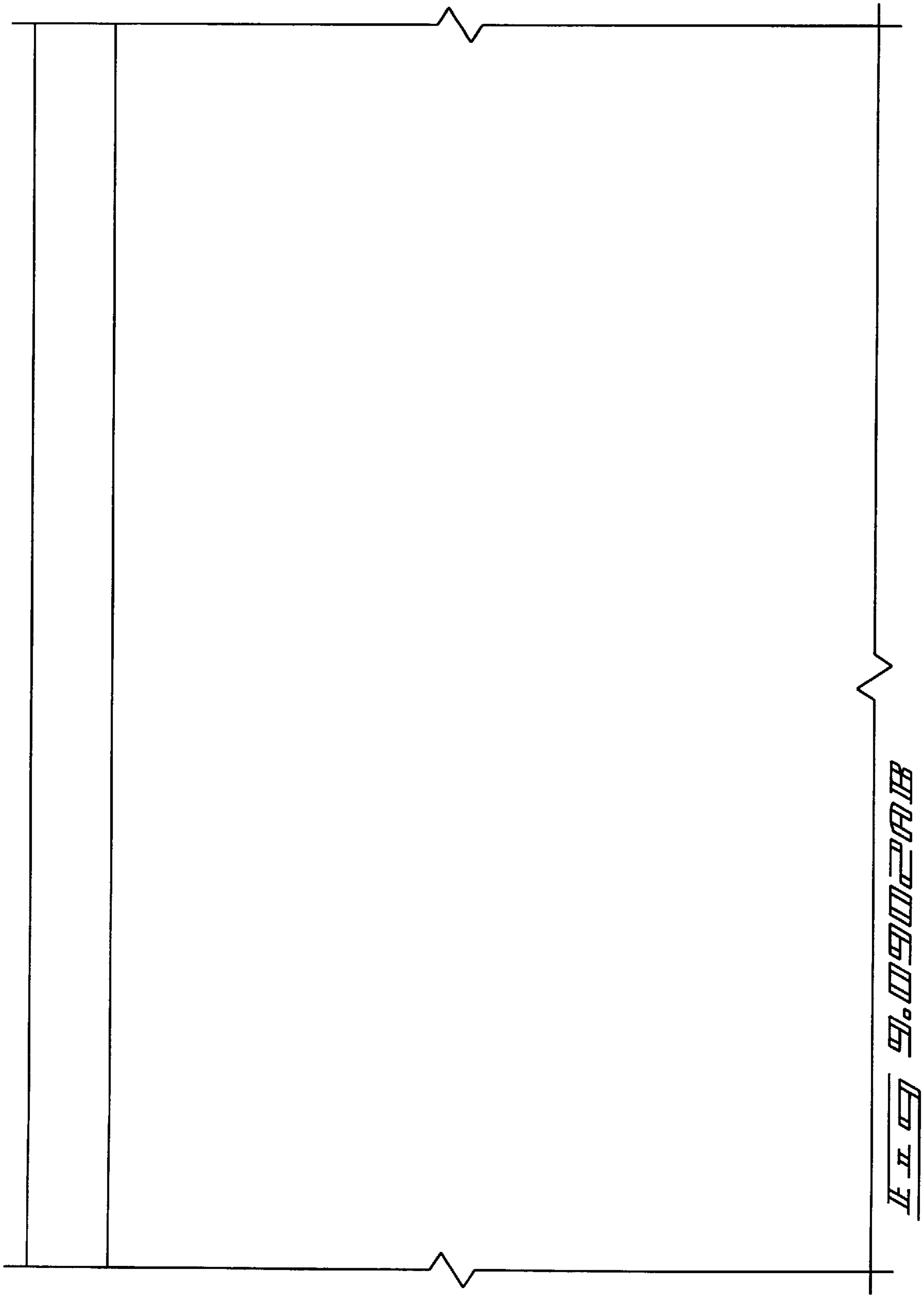
FIG. 9.0902AB

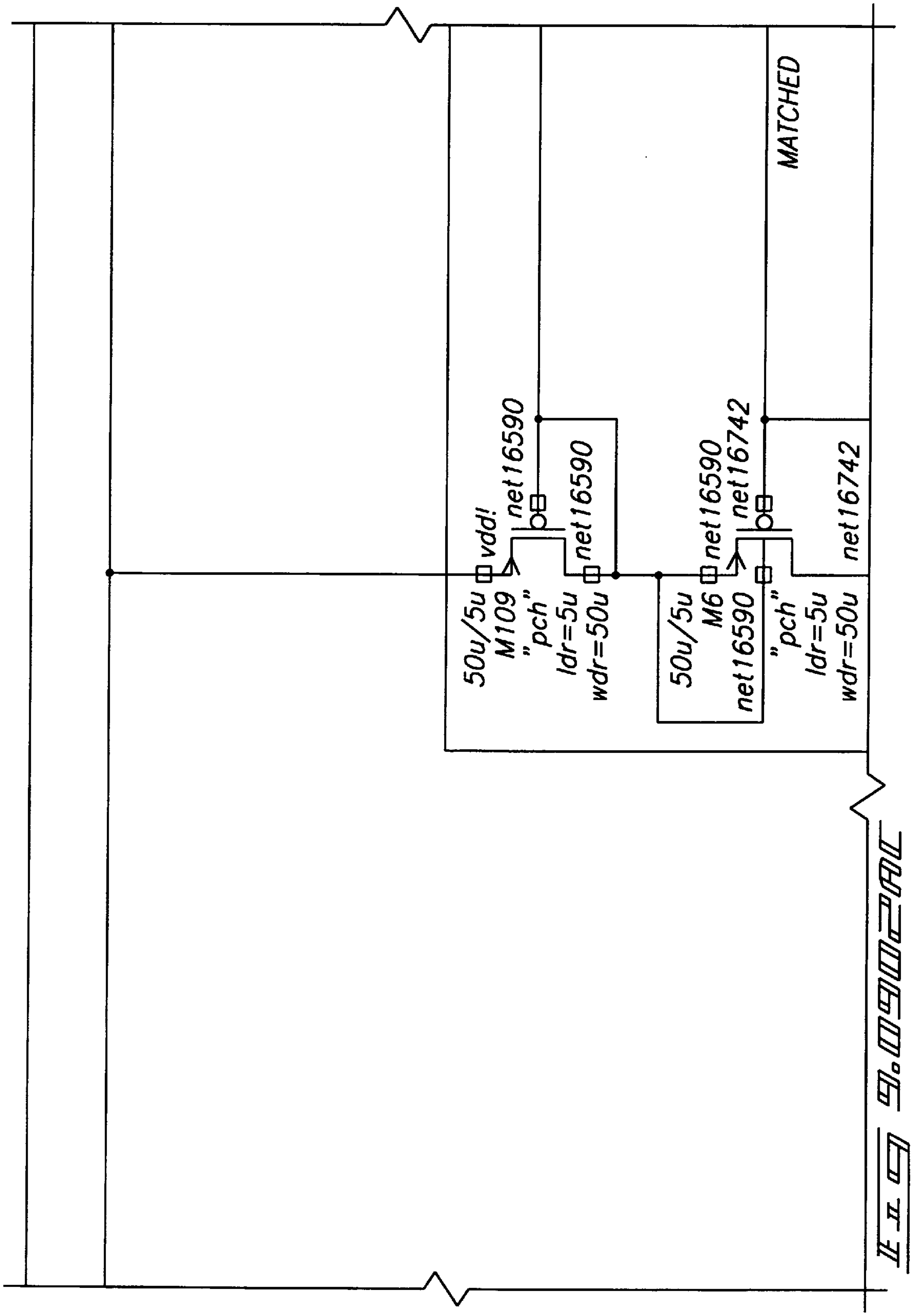
FIG. 9.0090ZAC

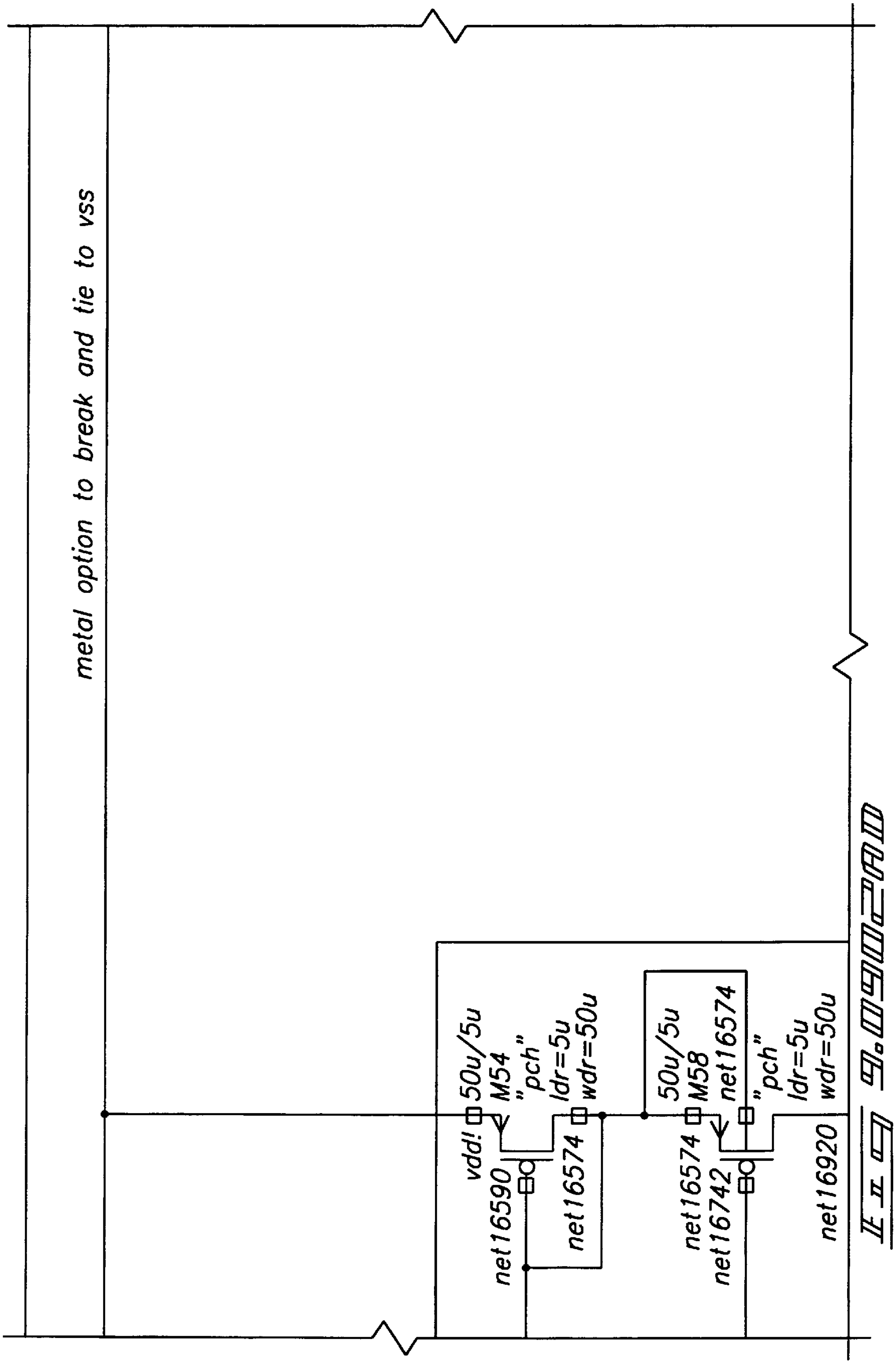
FIG. 9.009ZAD

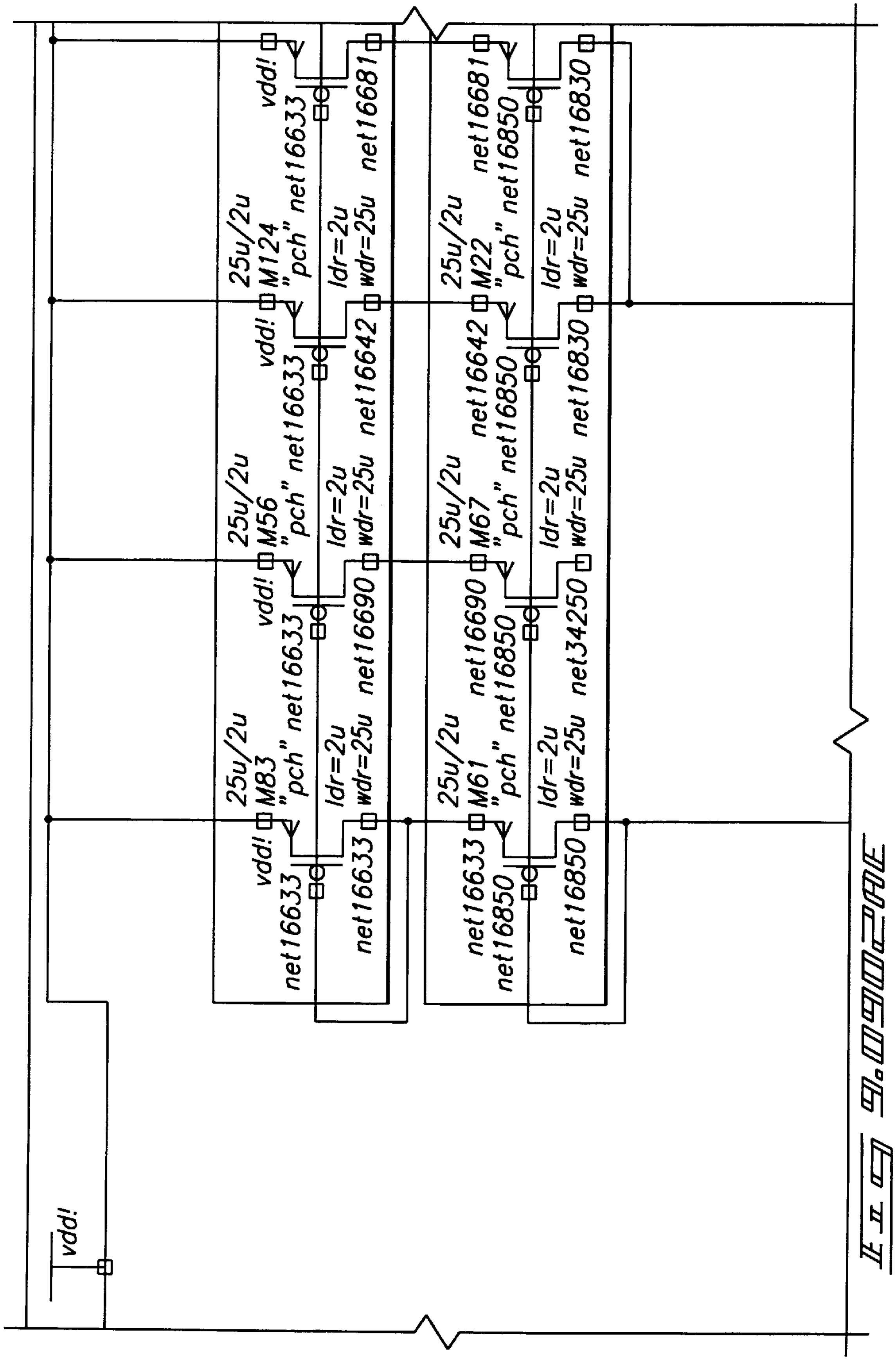
vdd!
25u/2u
M124
"pch" net16633
ldr=2u
wdr=25u
net16681
M56
net16642
M83
net16690
net16633
M22
net16850
net16830
M67
net34250
M61
25u/2u
"pch"
ldr=2u
wdr=25u

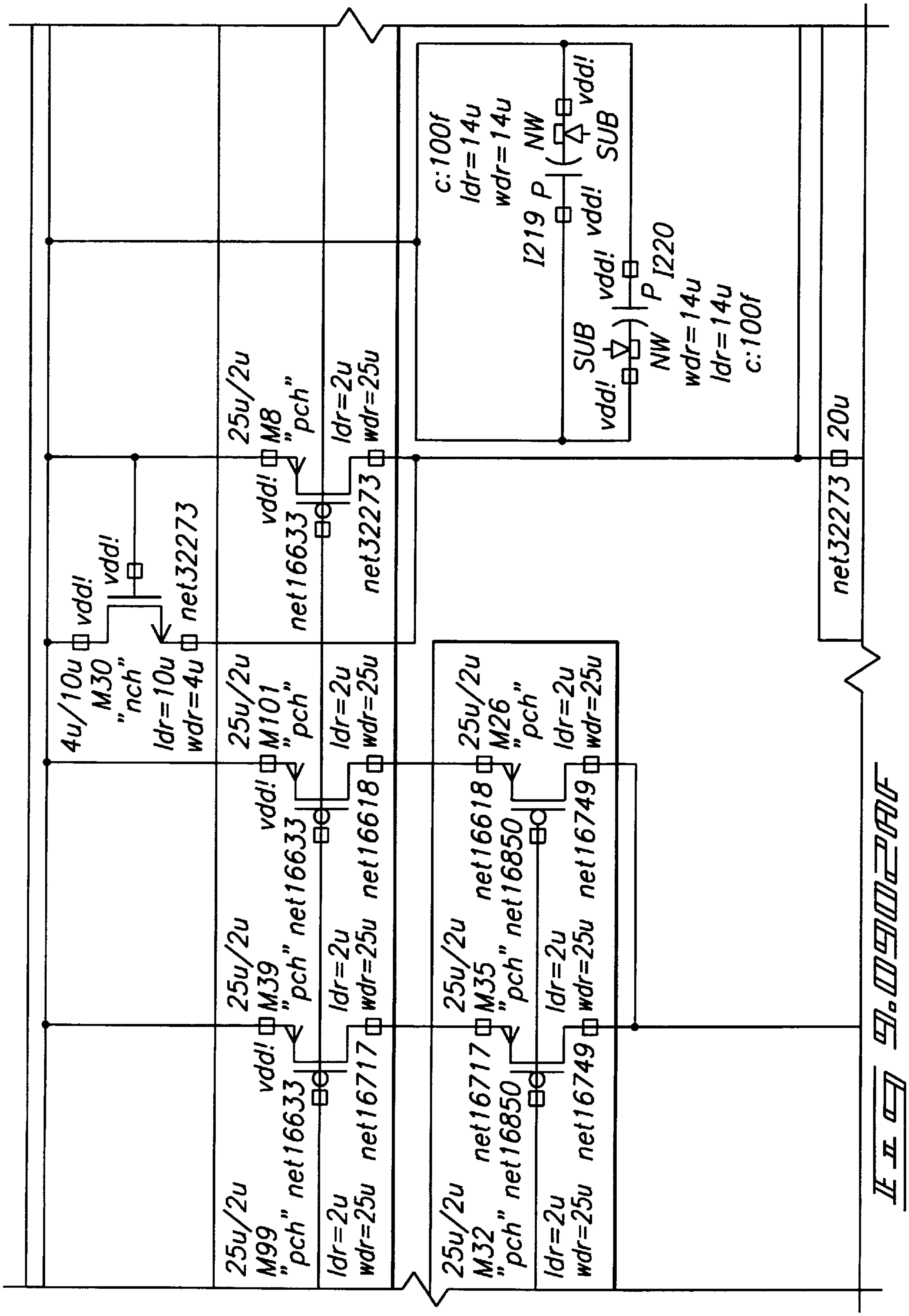
FIG. 9.0902AF

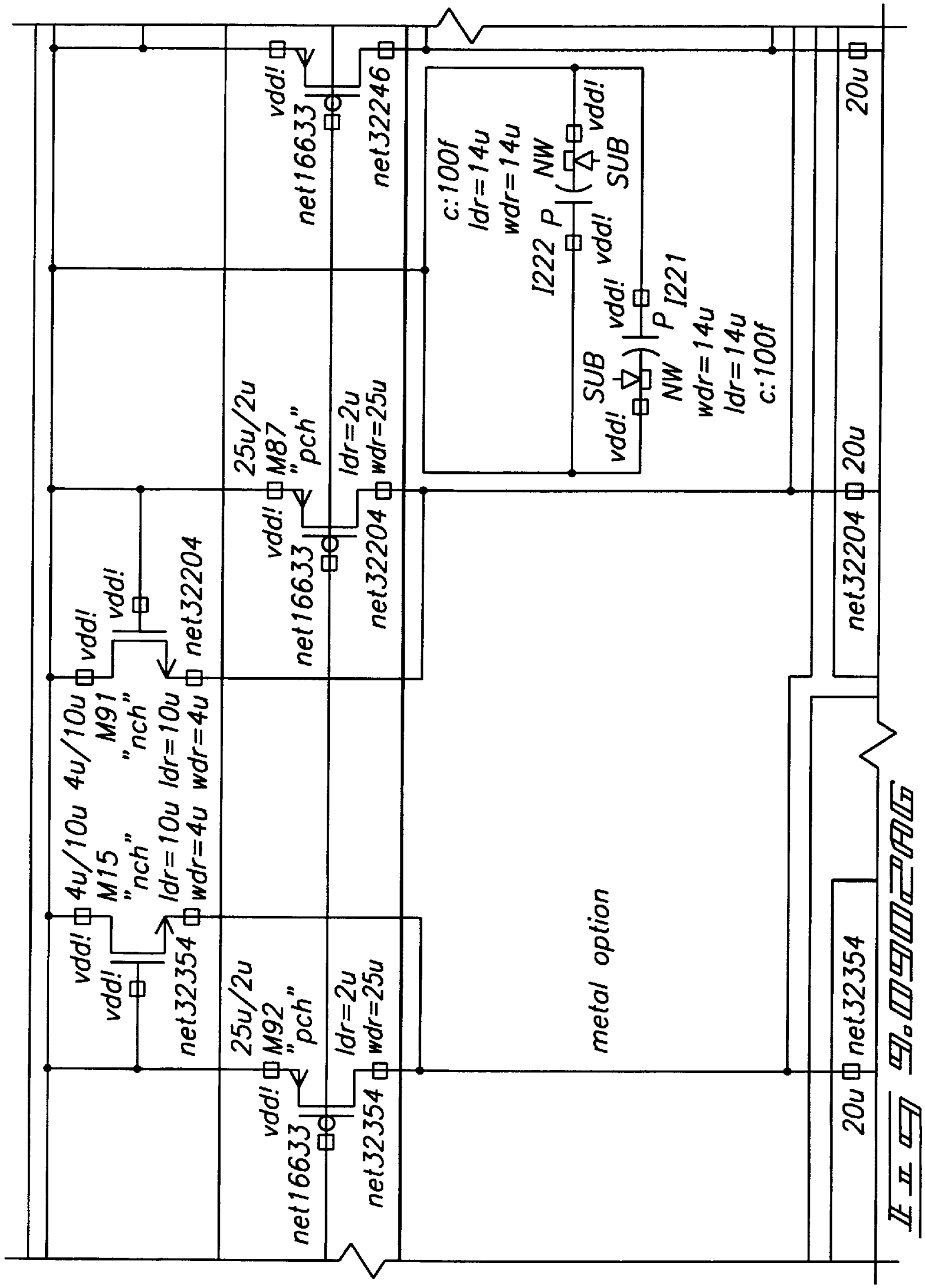
Fig 9.0090ZAG

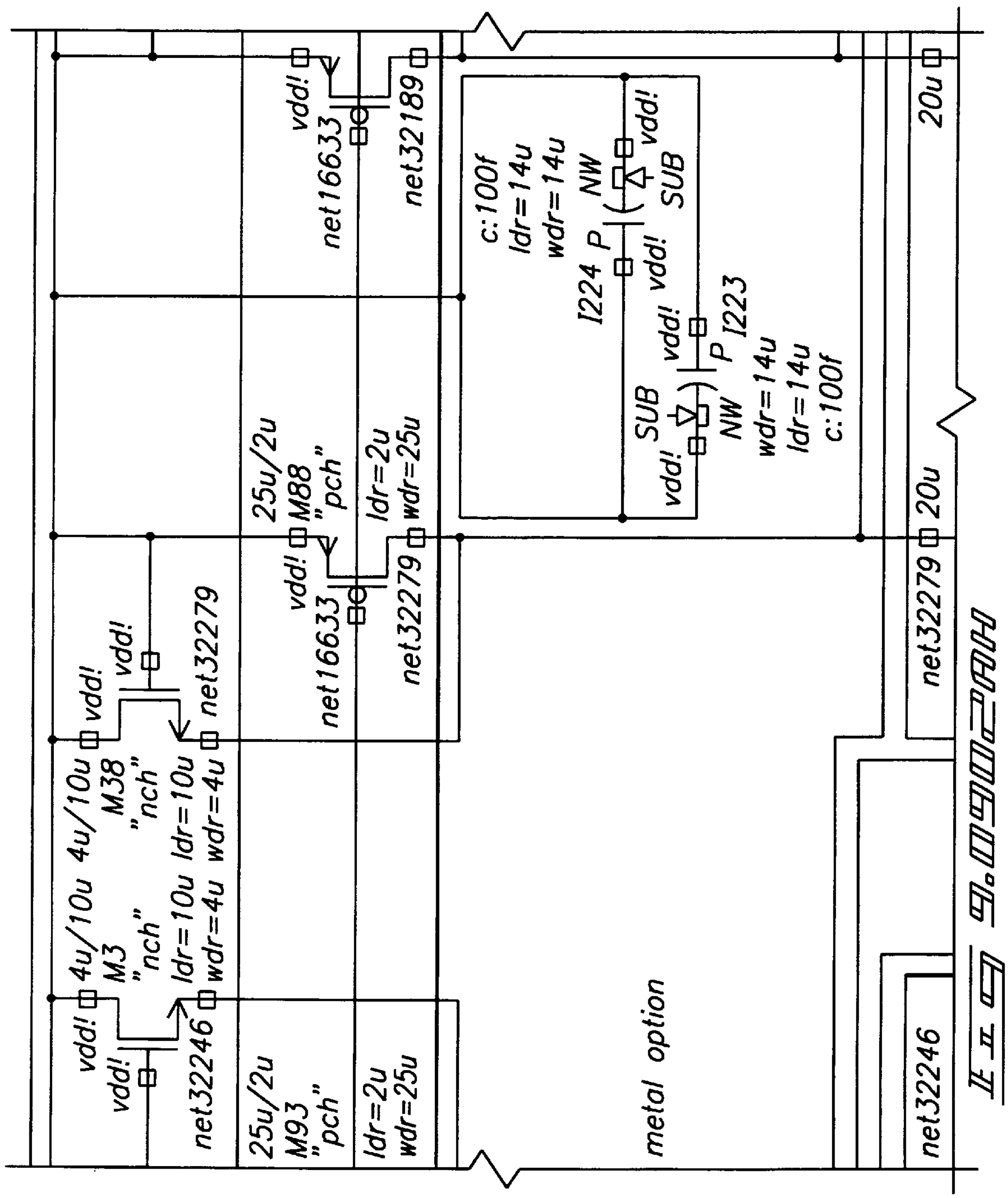
FIG. 9.09ZAH

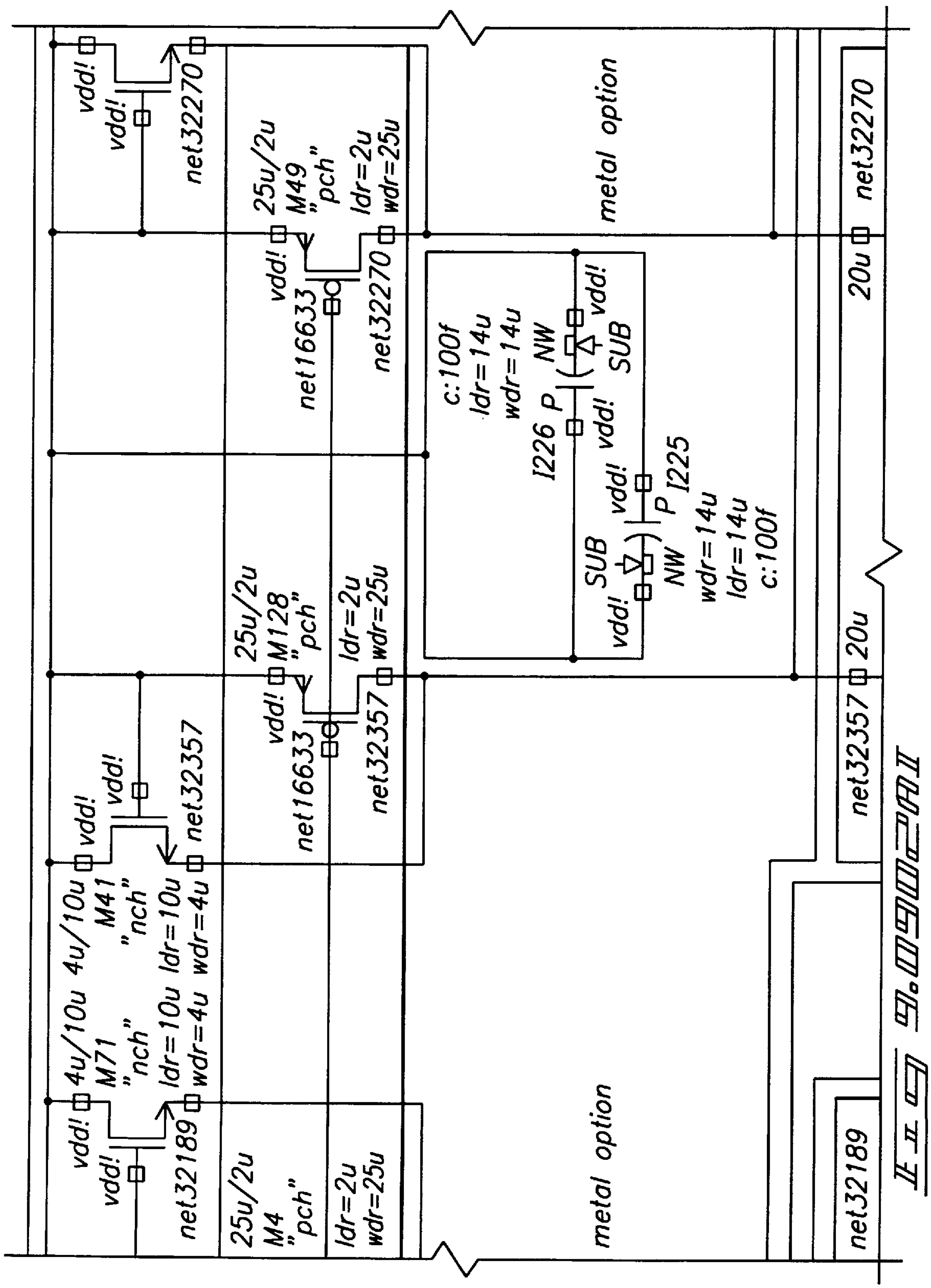
vdd!
vdd!
net32270
25u/2u
M49
"pch"
ldr=2u
wdr=25u
metal option
net32270
vdd!
net16633
net32270
20u
c:100f
ldr=14u
wdr=14u
NW
vdd!
SUB
I226
P
vdd!
vdd!
I225
P
SUB
NW
wdr=14u
ldr=14u
c:100f
vdd!
25u/2u
M128
"pch"
ldr=2u
wdr=25u
20u
vdd!
net16633
net32357
net32357
vdd!
vdd!
net32357
4u/10u
M41
"nch"
ldr=10u
wdr=4u
4u/10u
M71
"nch"
ldr=10u
wdr=4u
vdd!
vdd!
net32189
25u/2u
M4
"pch"
ldr=2u
wdr=25u
metal option
net32189

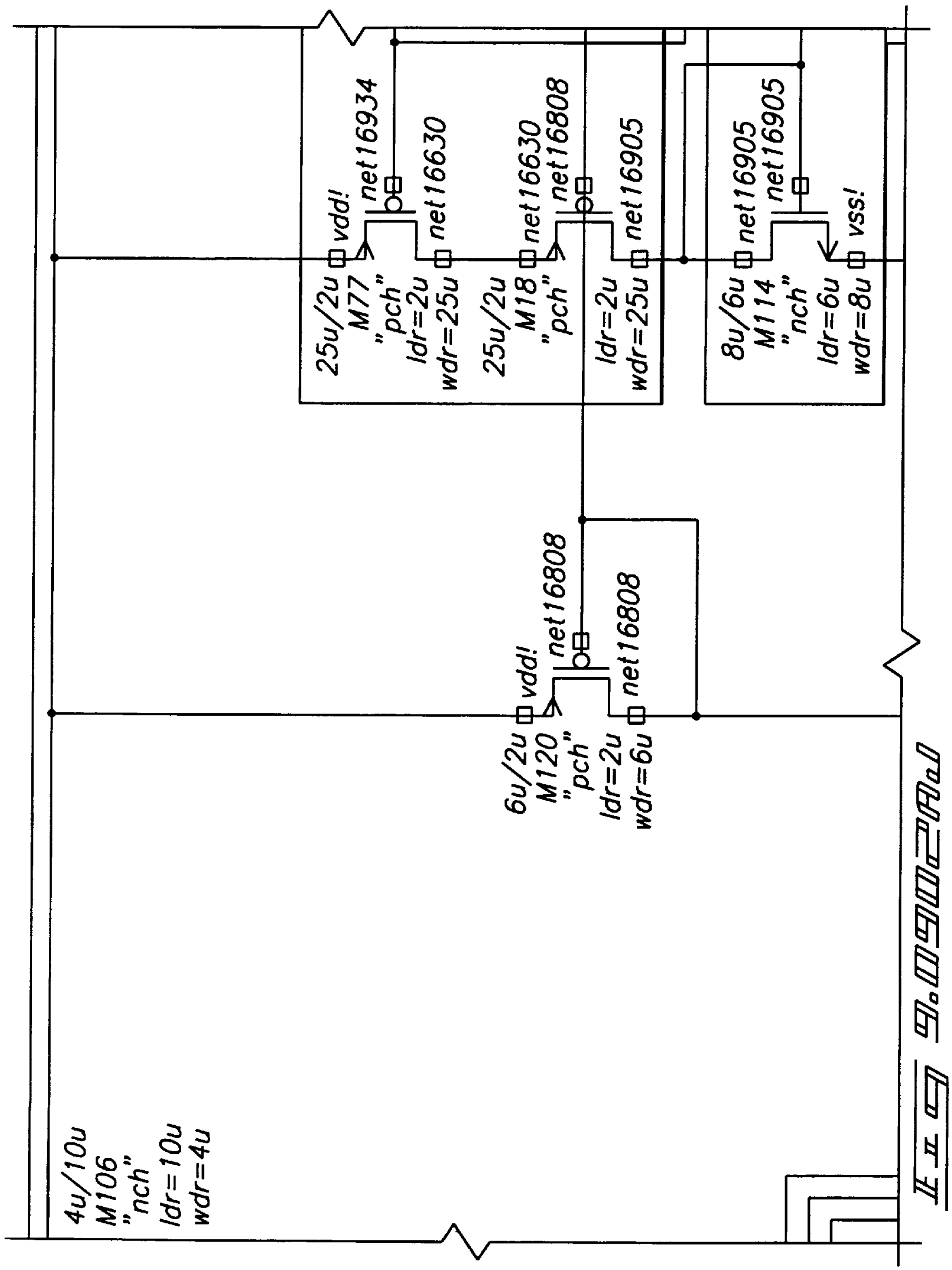
Fig. 9.0902AJ

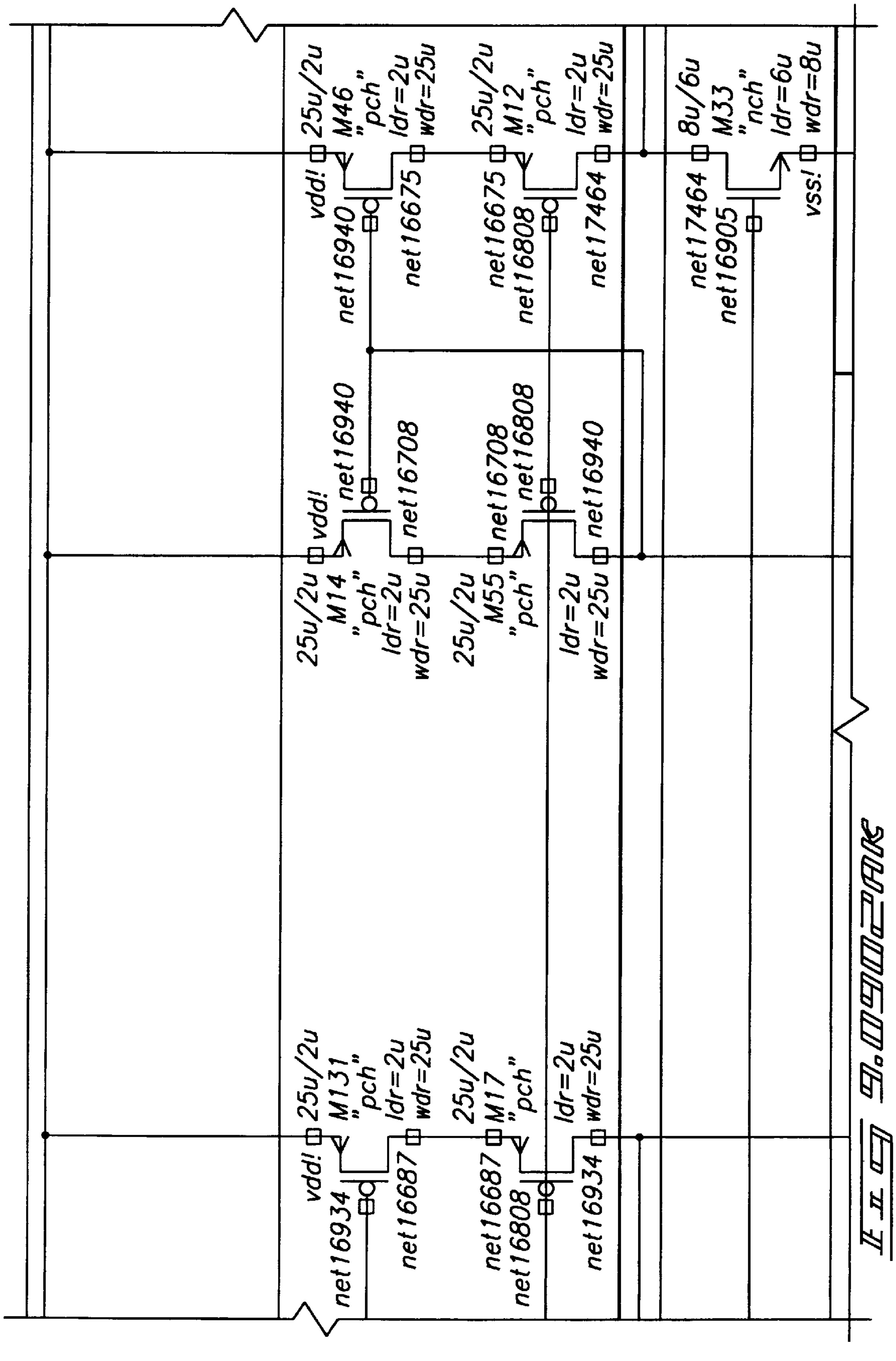
Fig. 9.0902AK

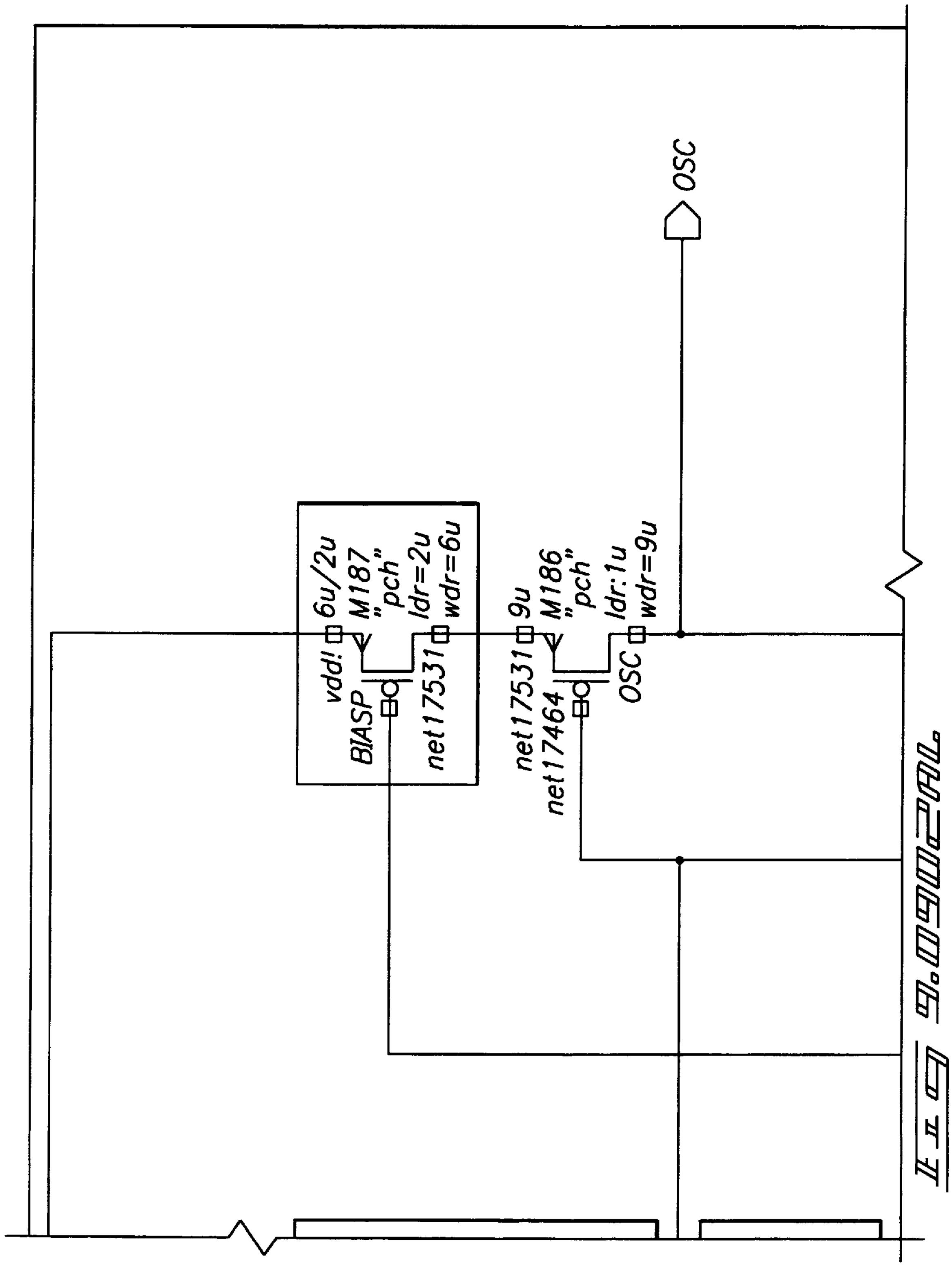
FIG. 9.09M2AL

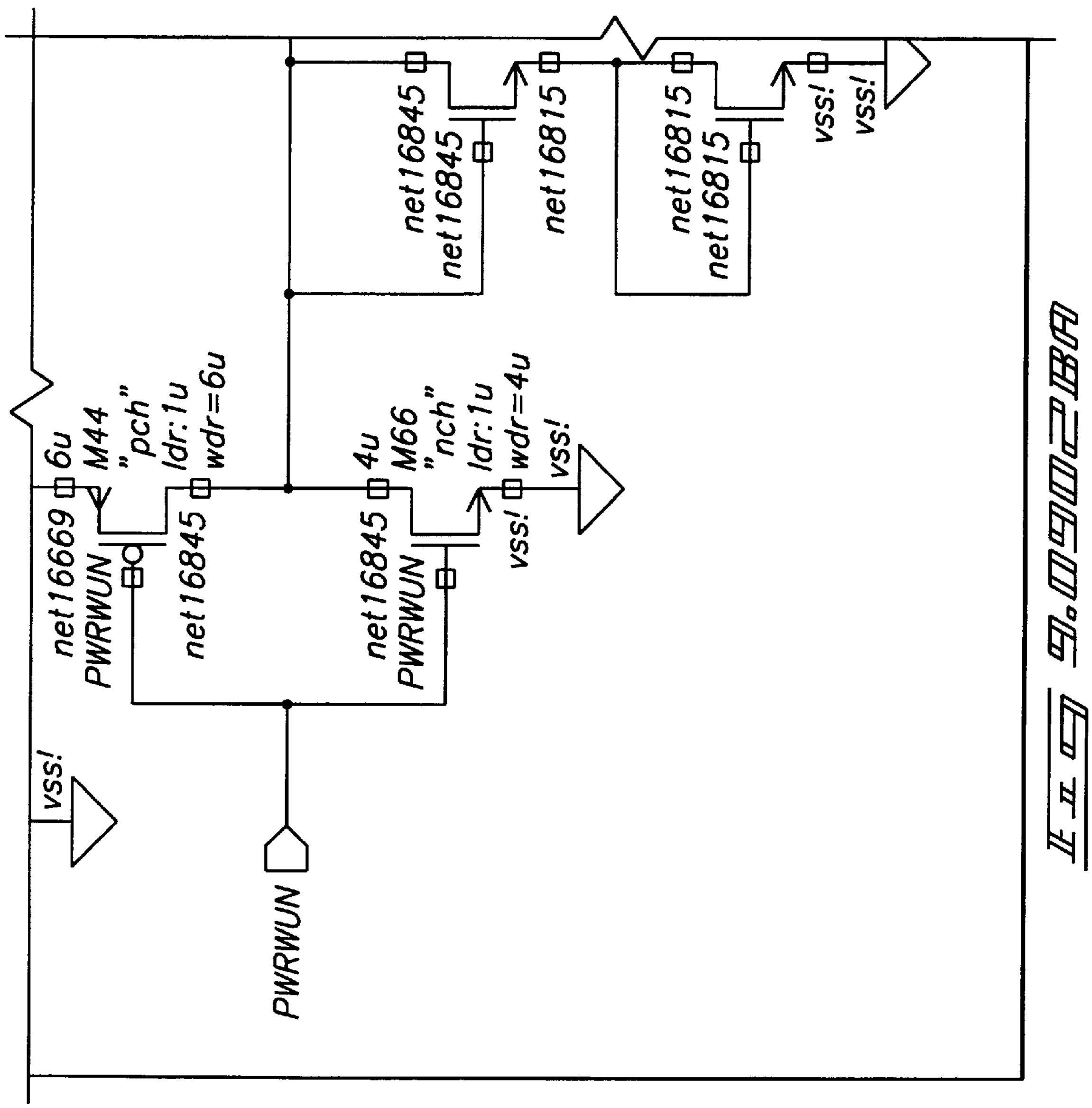
FIG. 9.0902BA

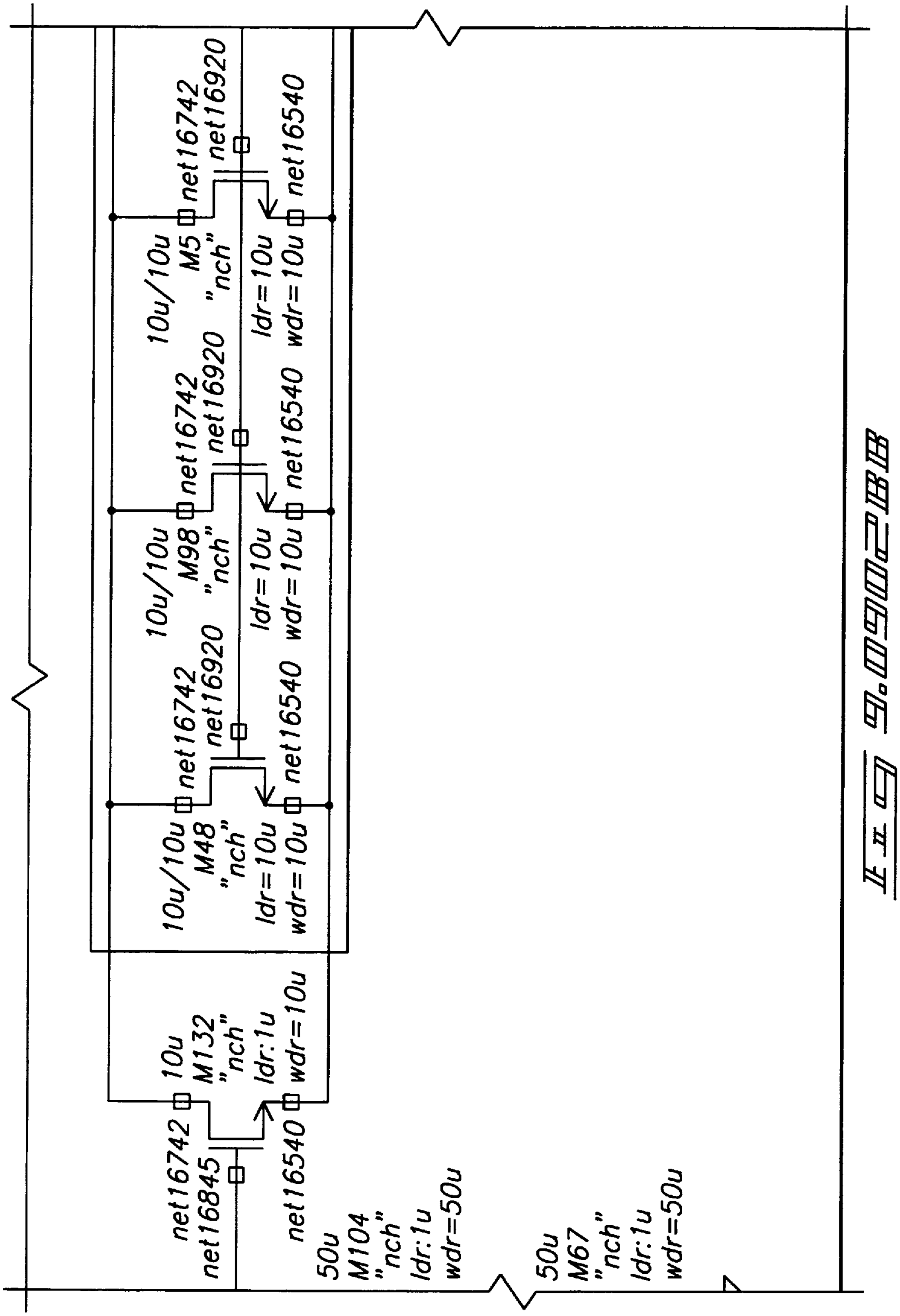
Fig. 9.0902BB

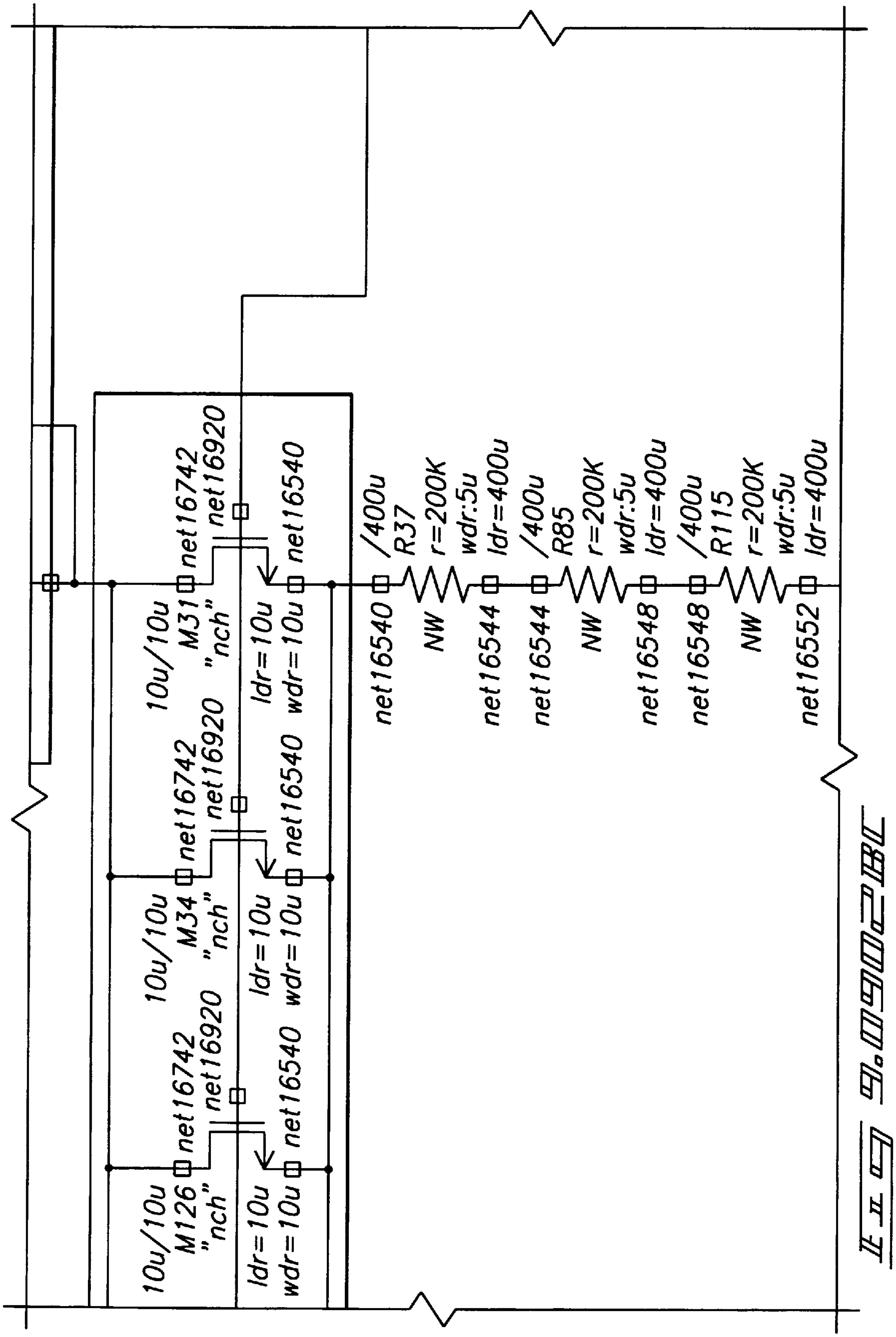
FIG. 9.0902BC

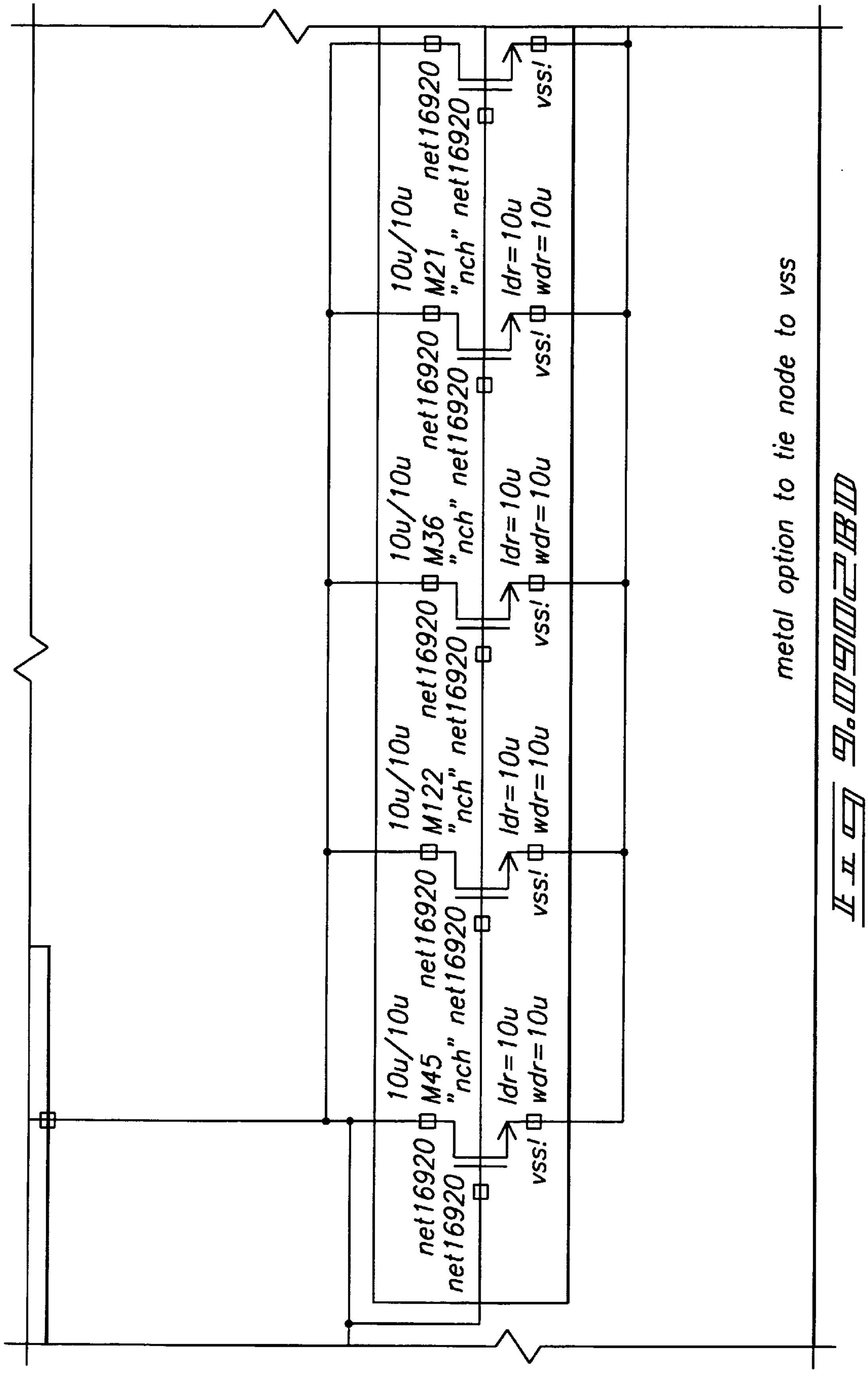
Fig 9.090.2BD

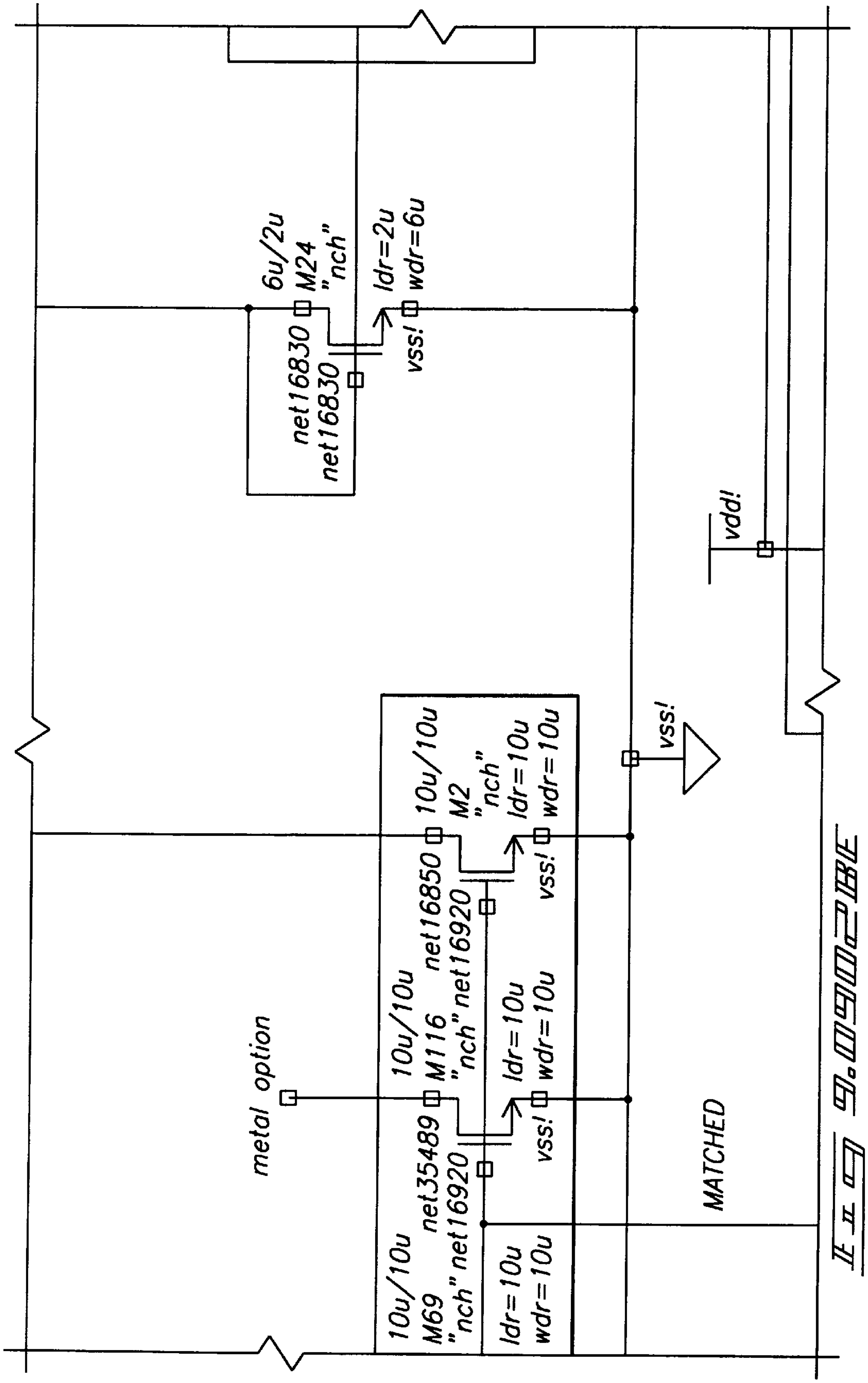
Fig 9.0902BE

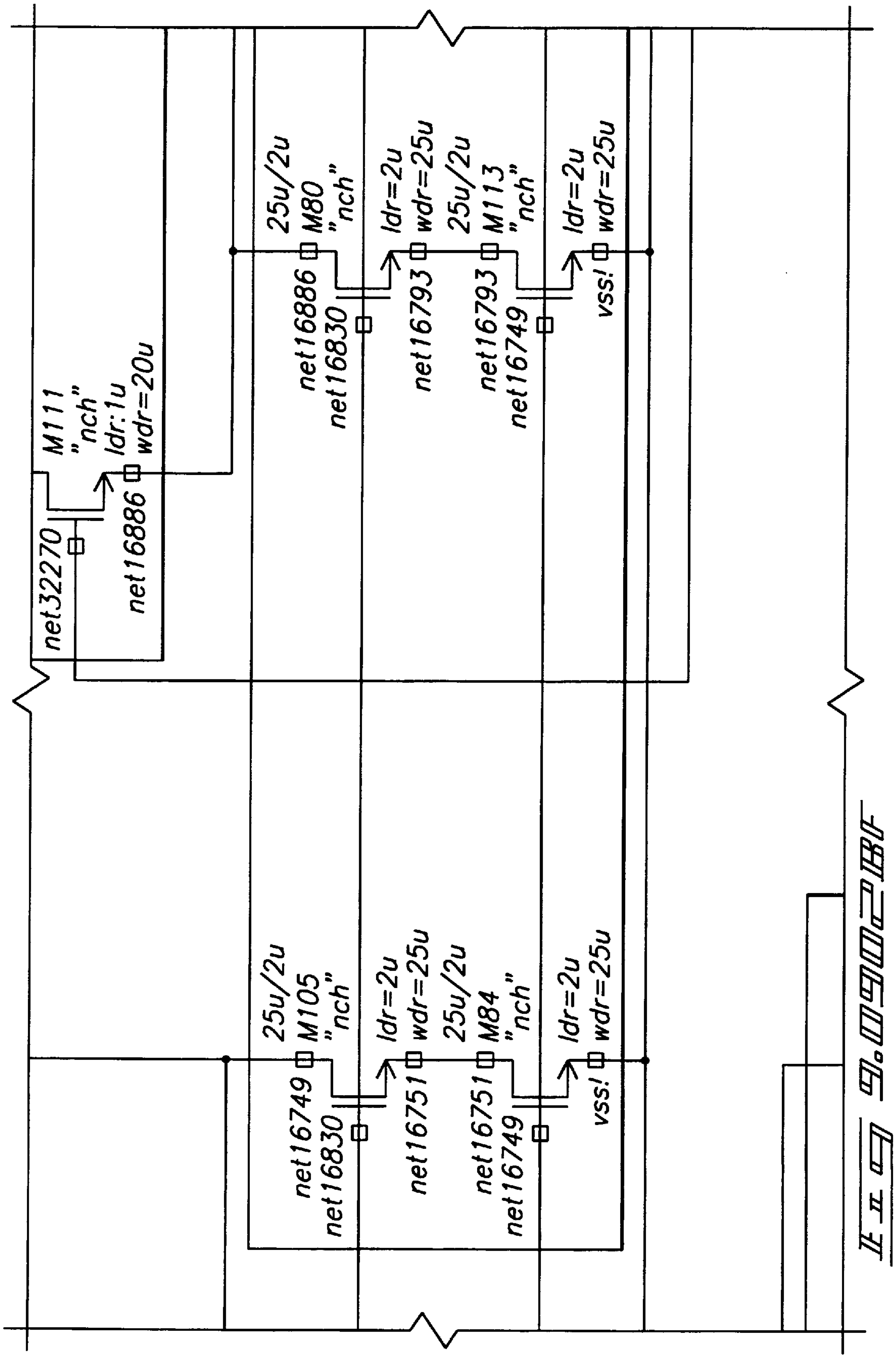
FIG. 9.0902BF

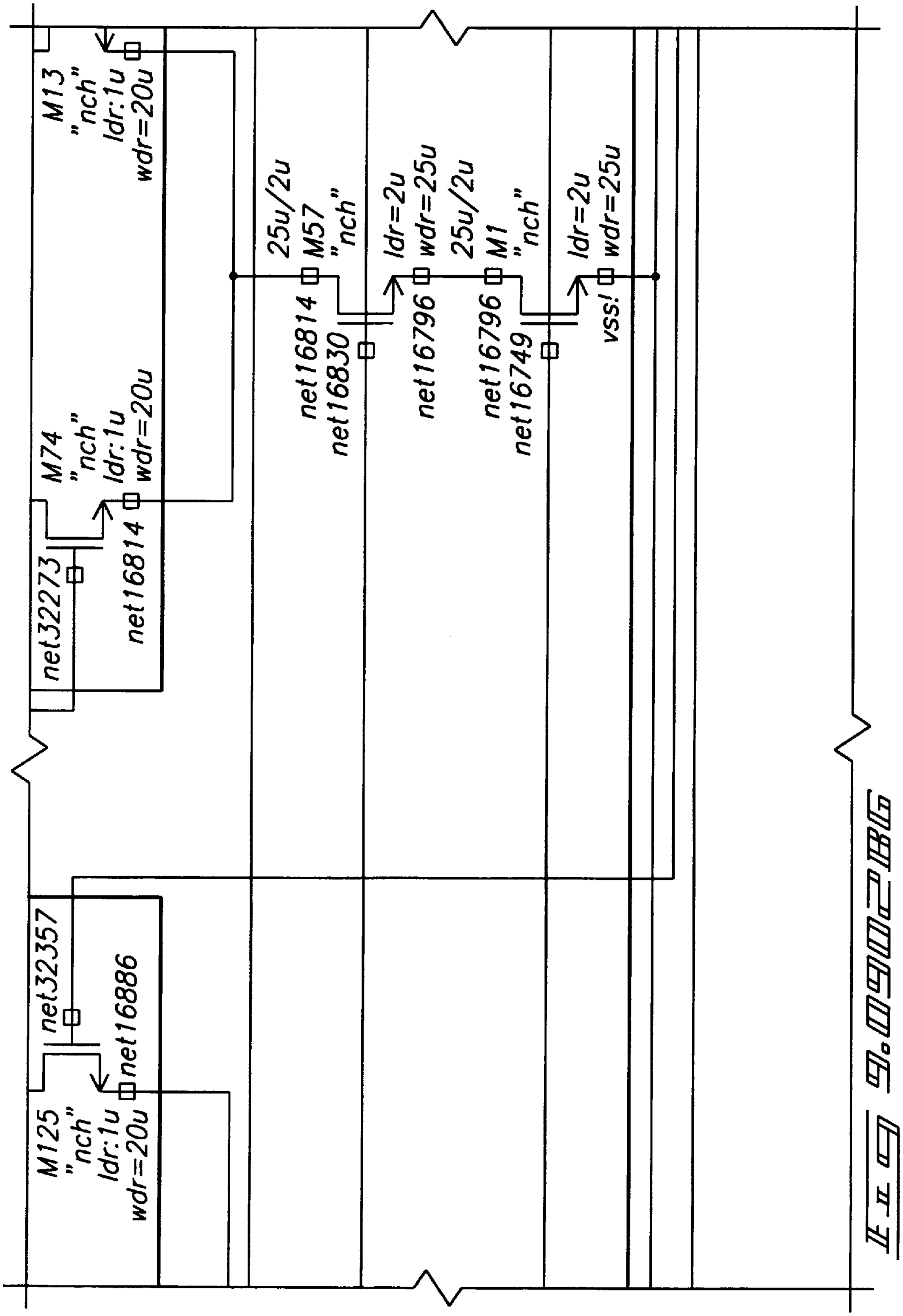
FIG. 9.0902BG

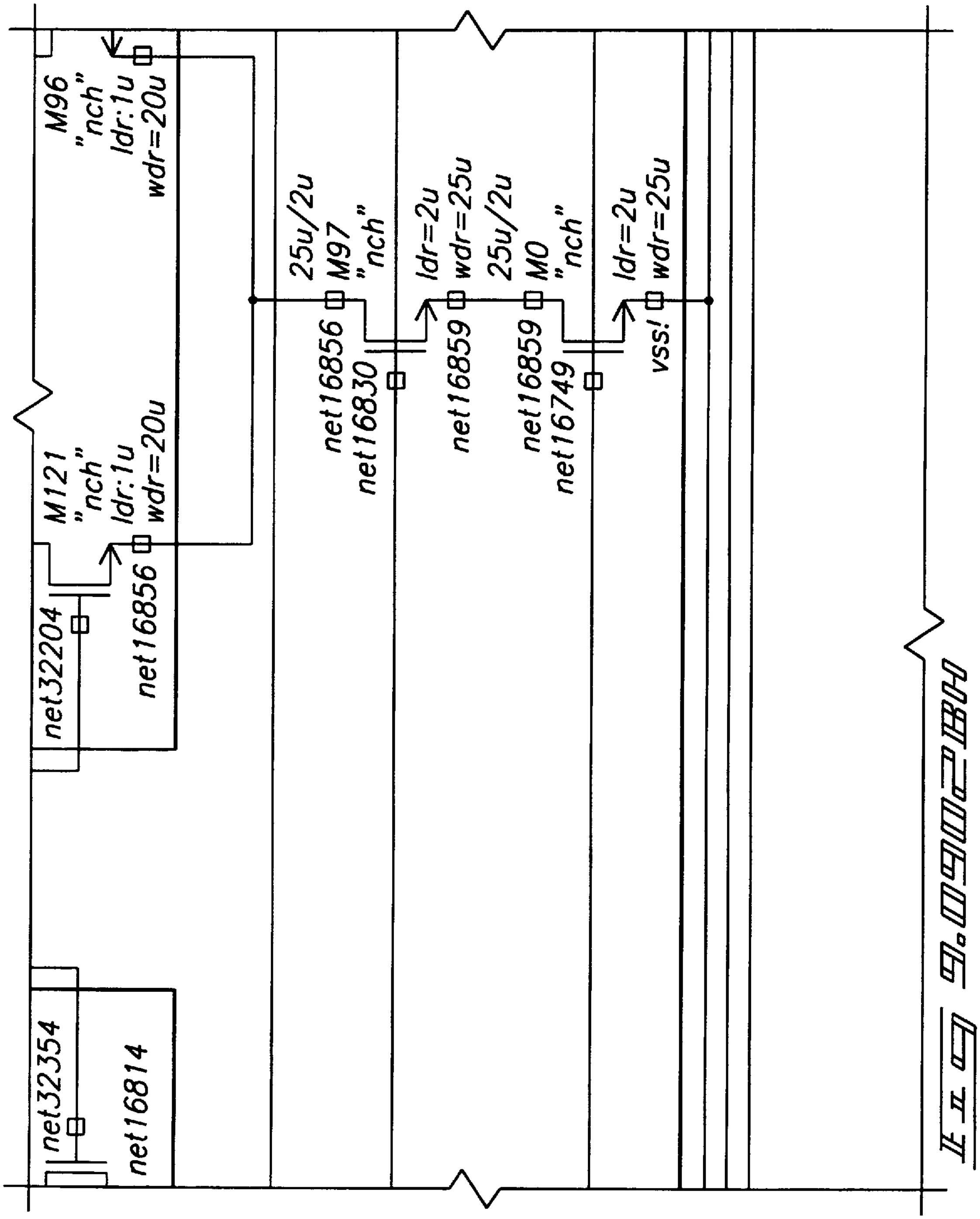
Fig. 9.0902BH

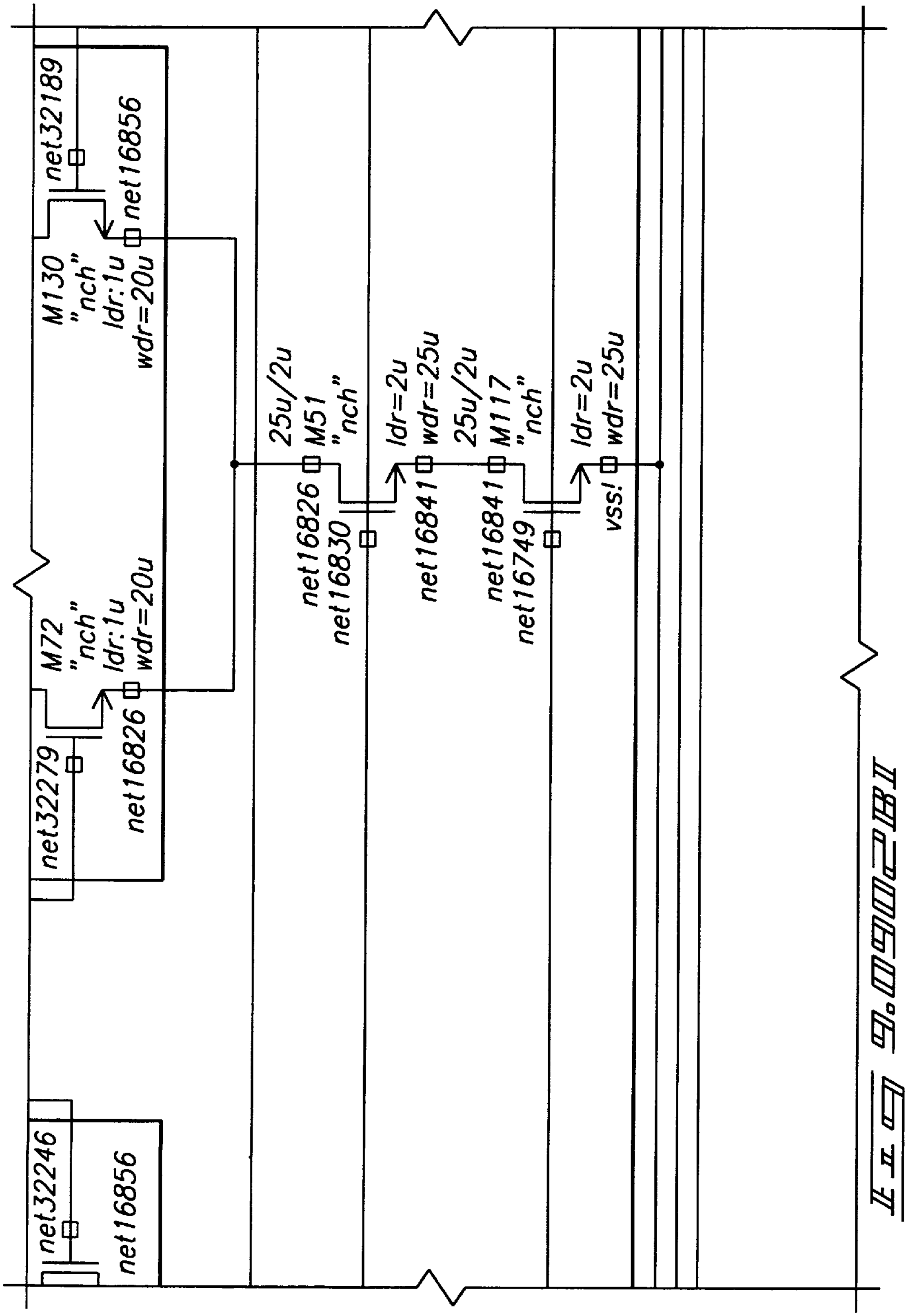
Fig 9.0902BII

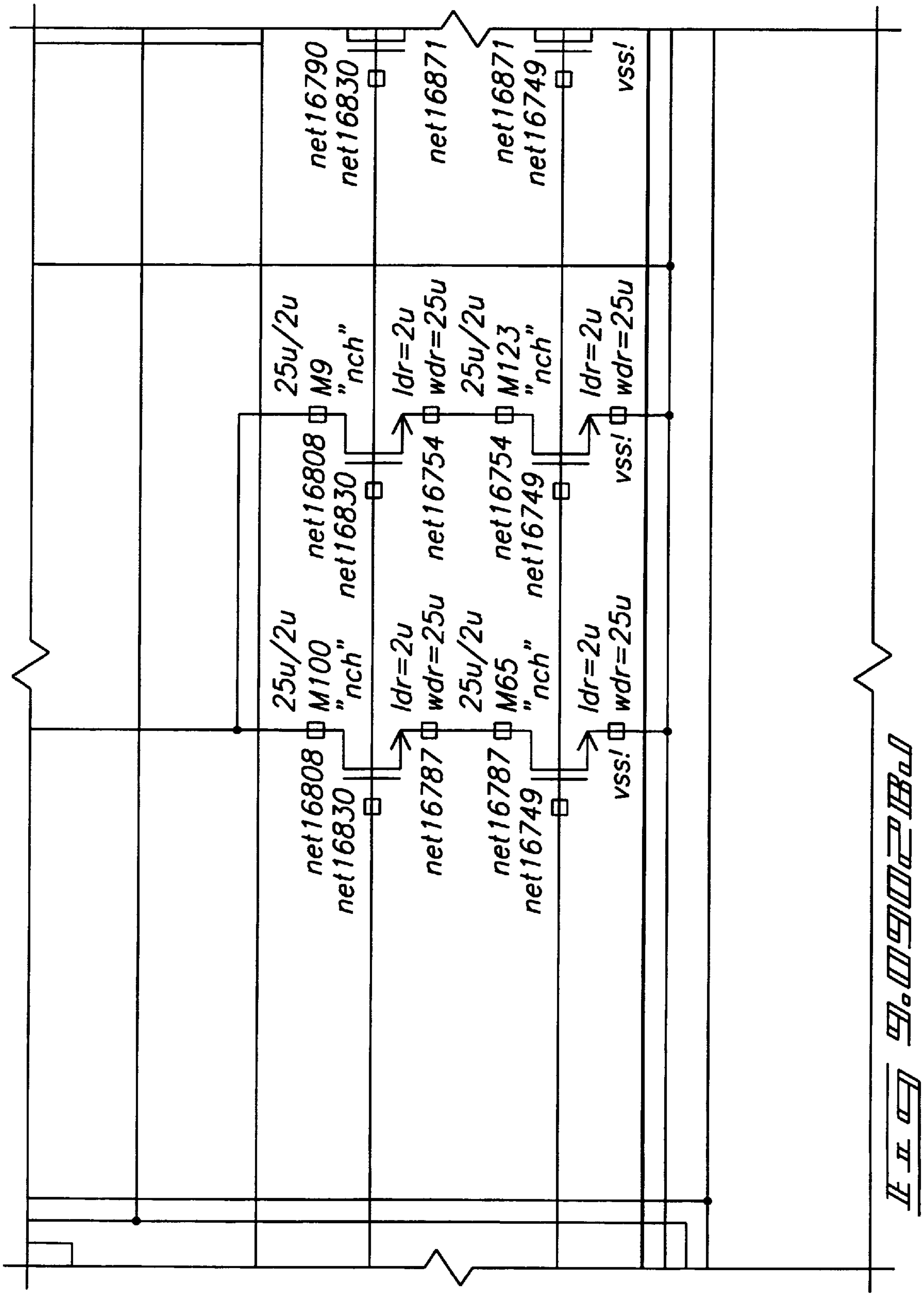
Fig. 9.0902B.J

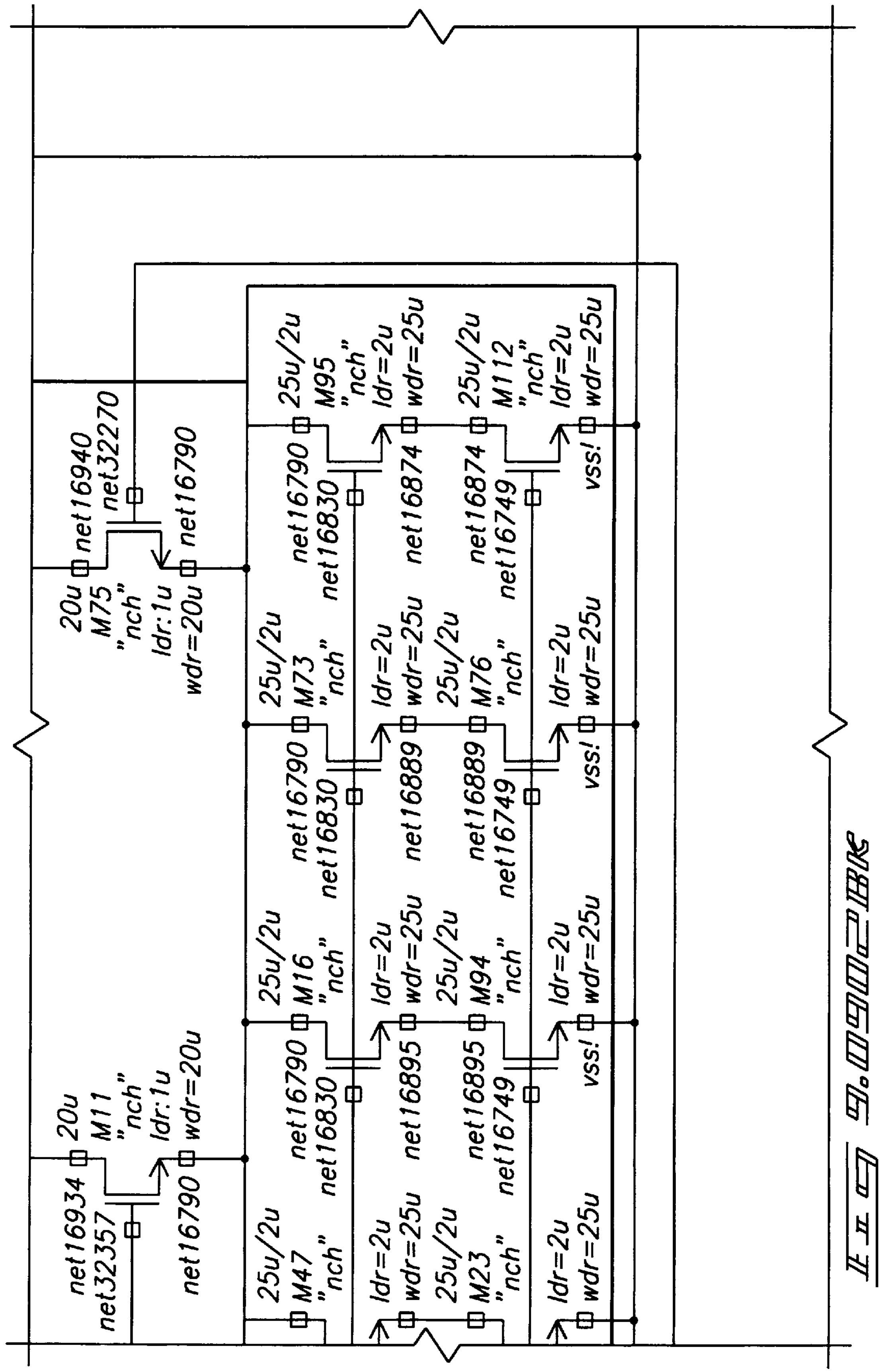
Fig. 9.0902BK

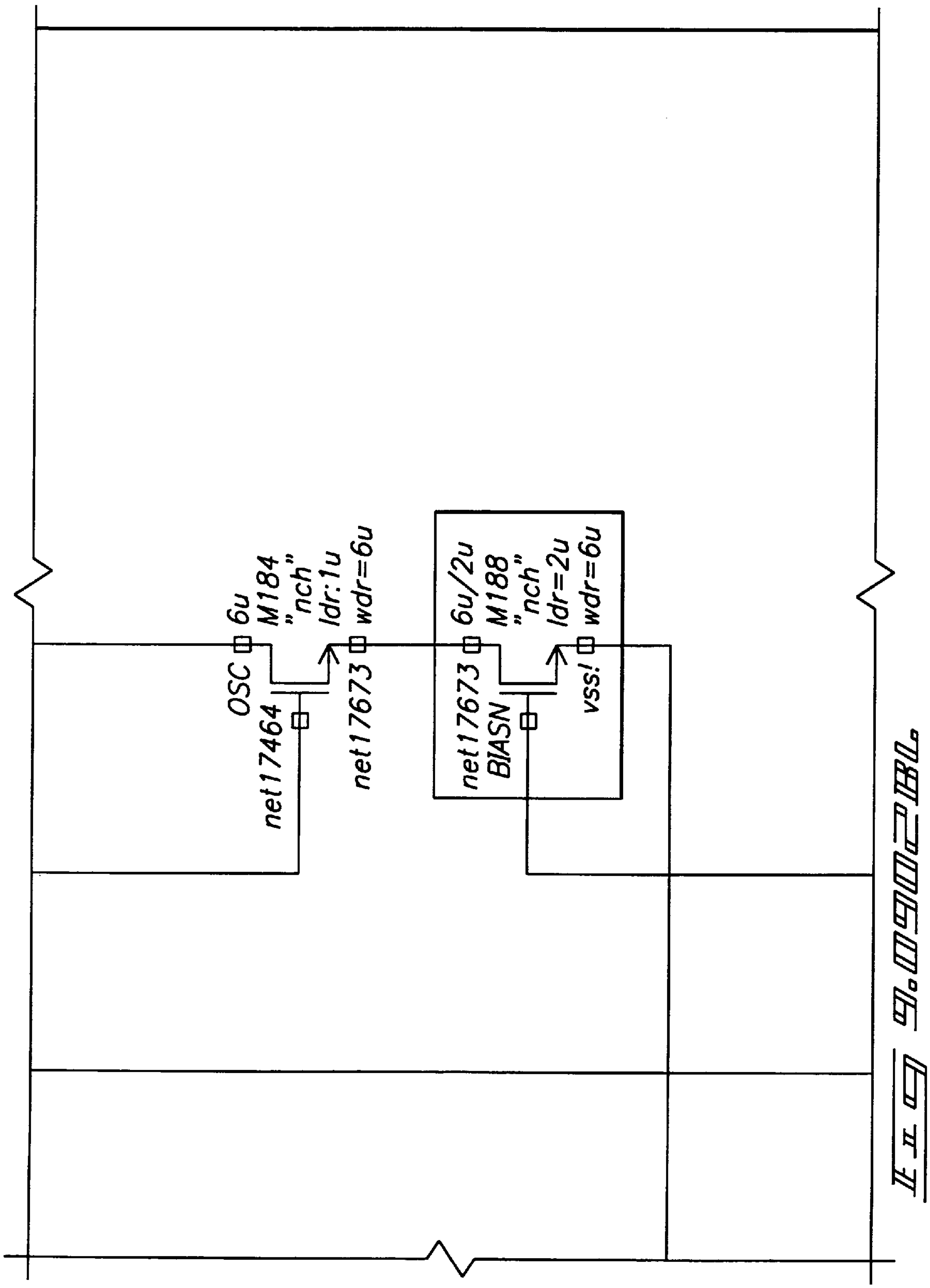
Fig. 9.0902BL

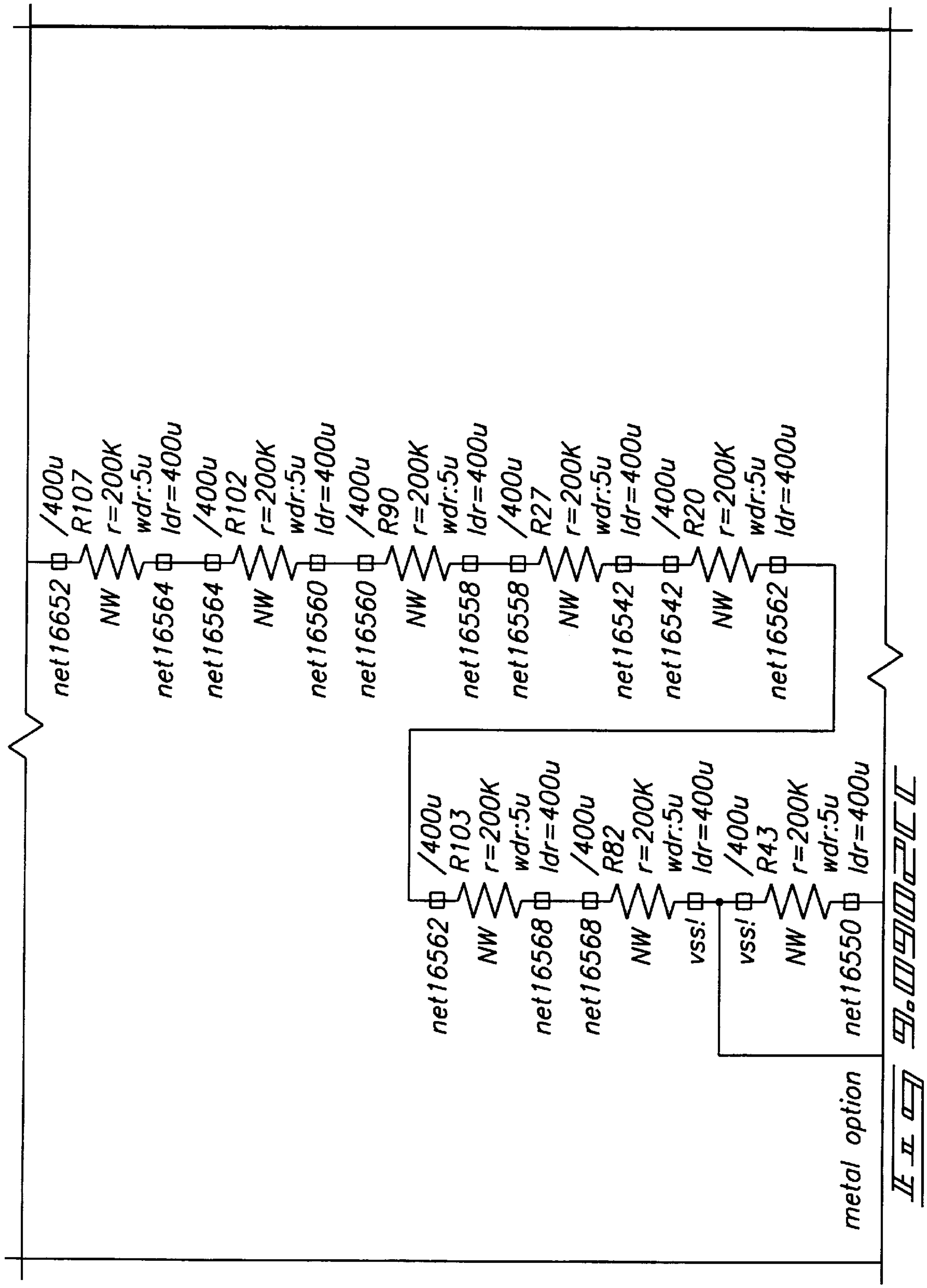
FIG. 9.0902CC

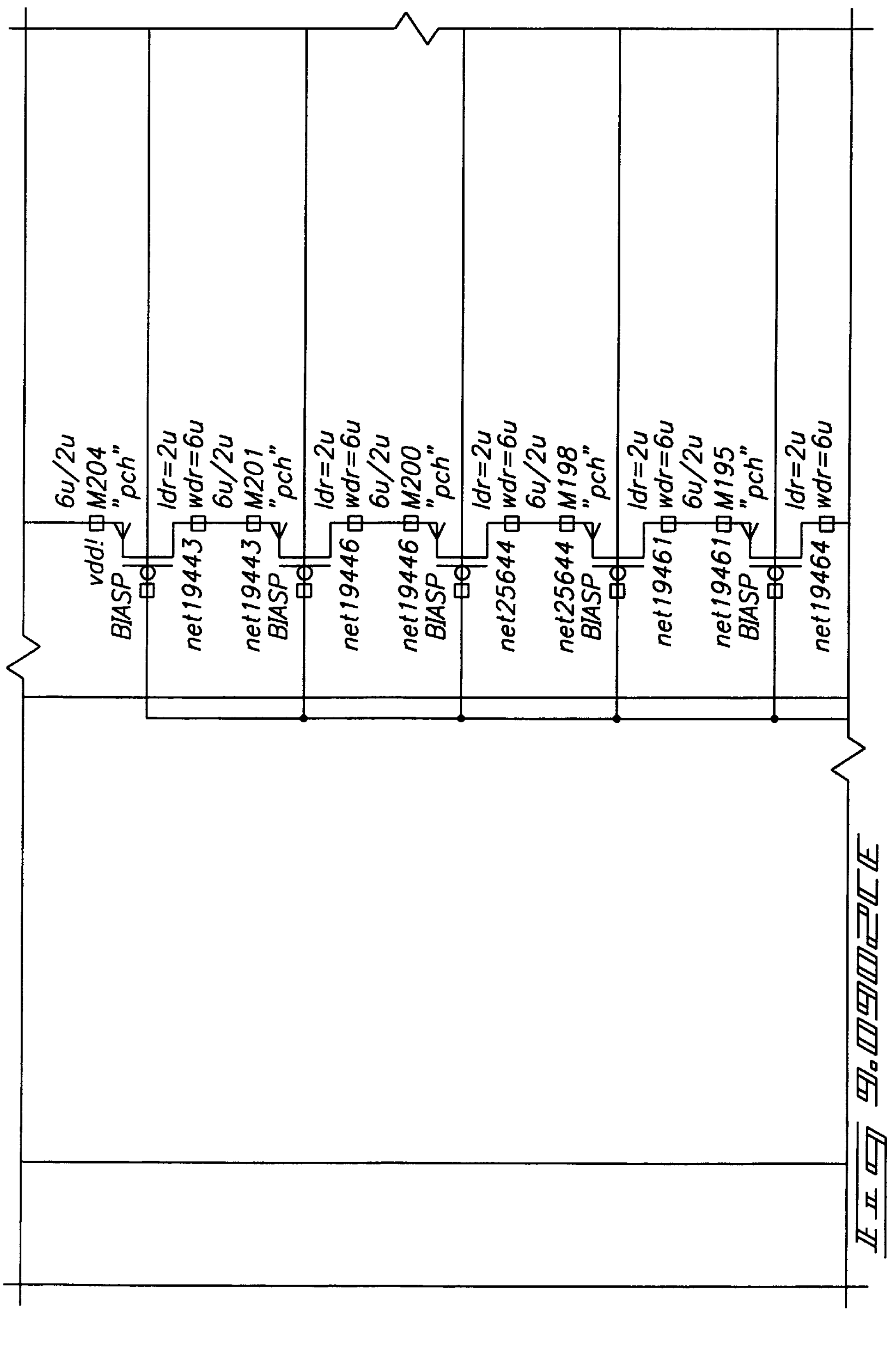
Fig. 9.0902CE

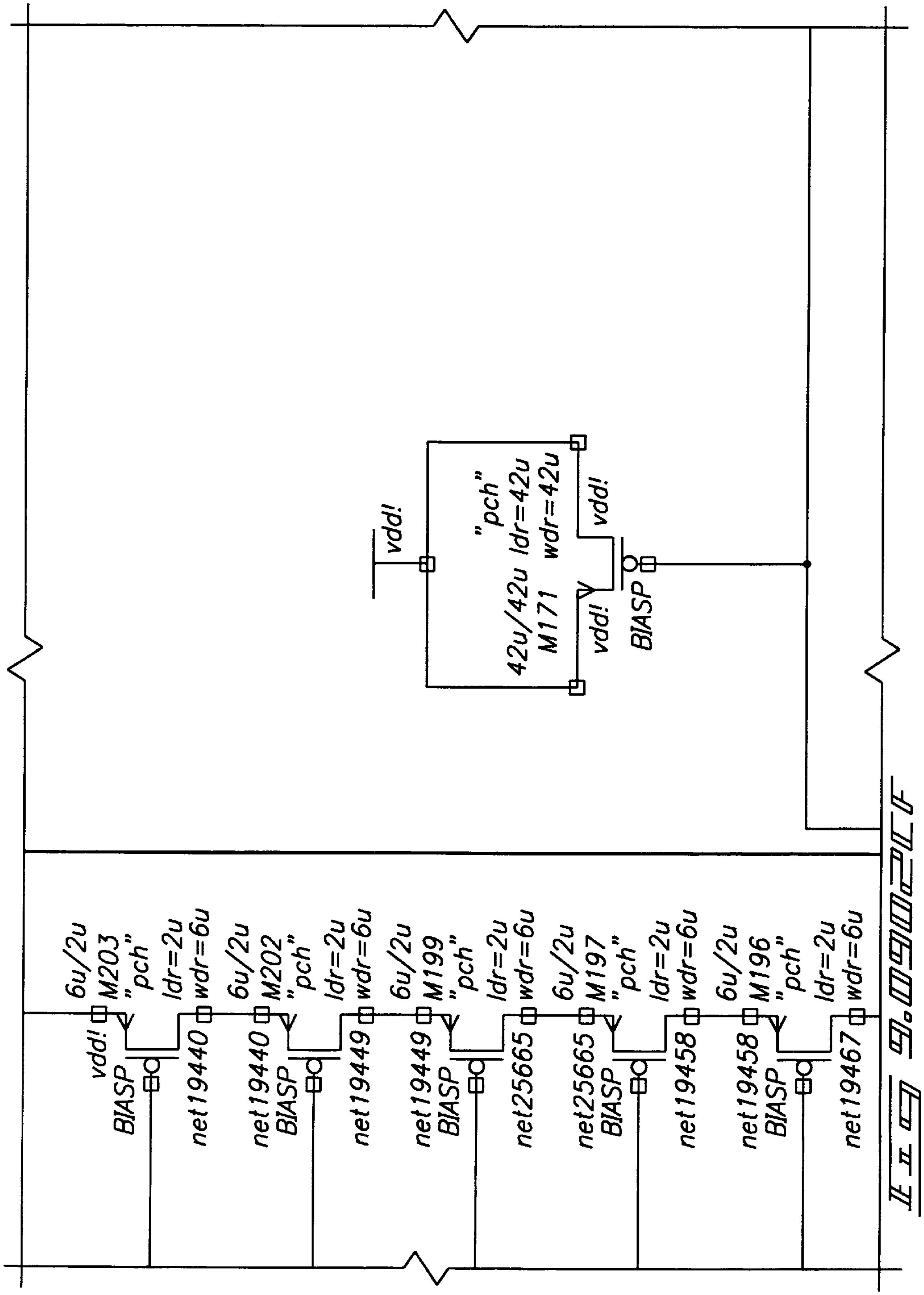
FIG. 9.090.2CF

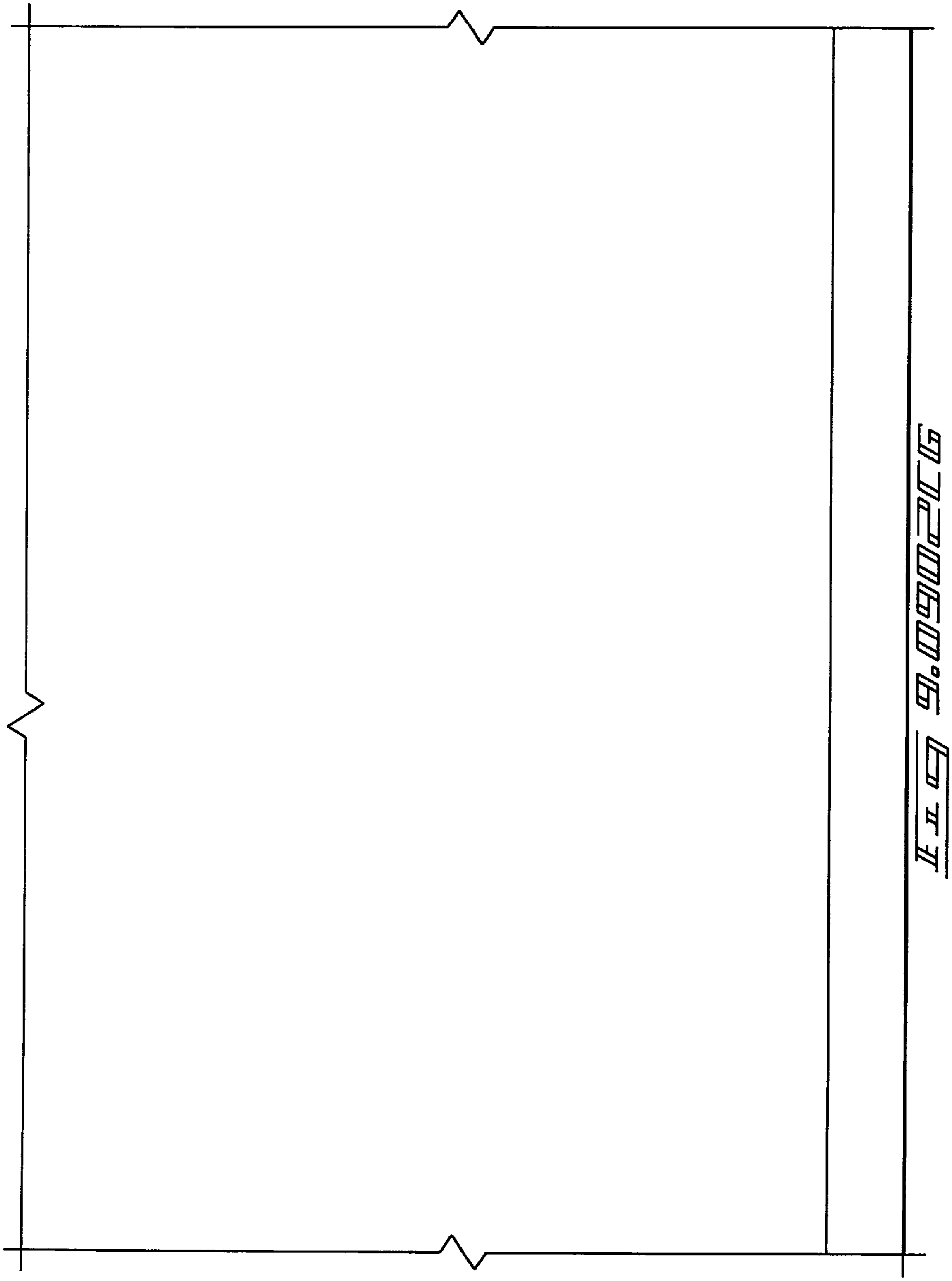
Fig. 9.0902CG

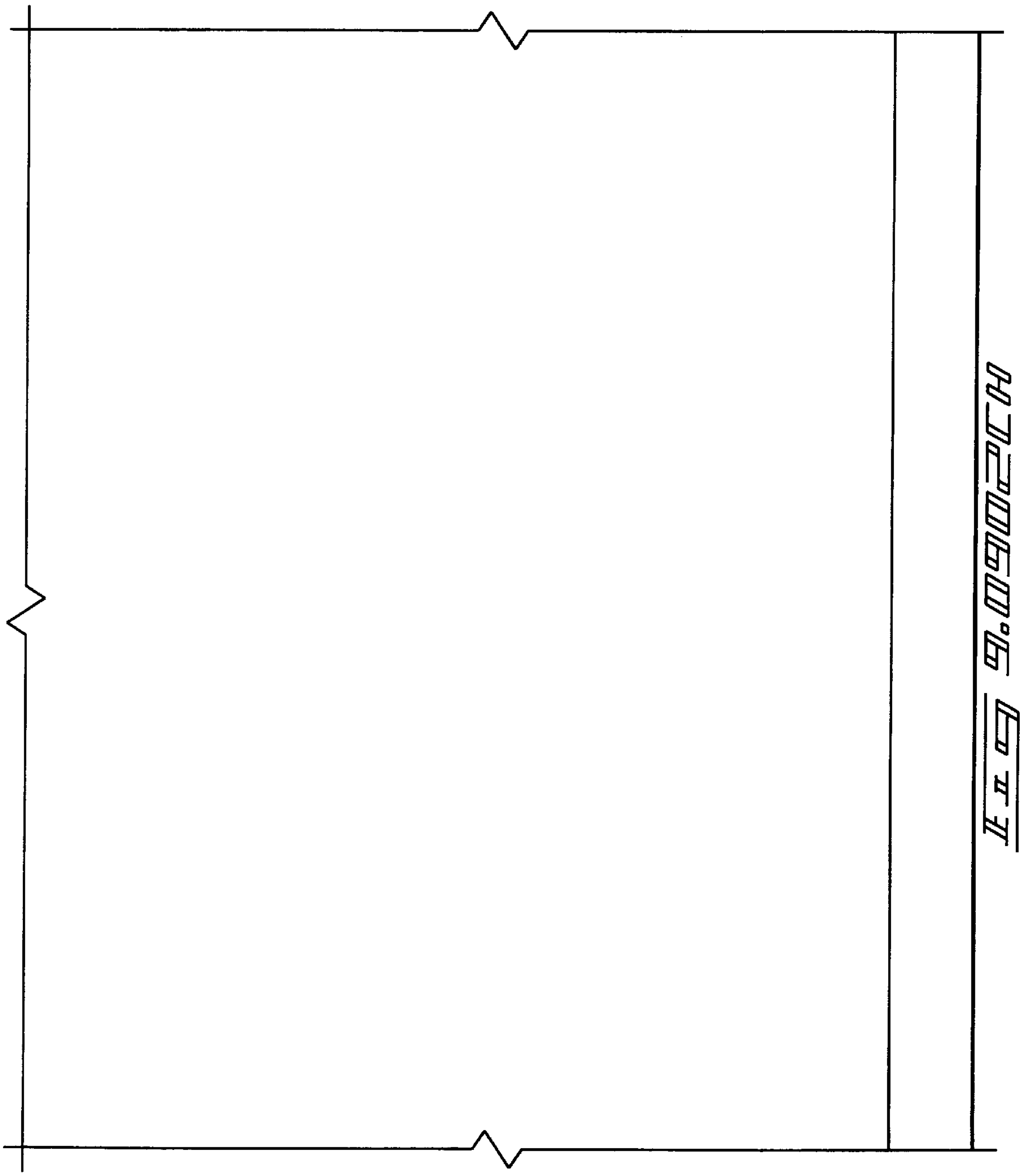
FIG. 9.0902CH

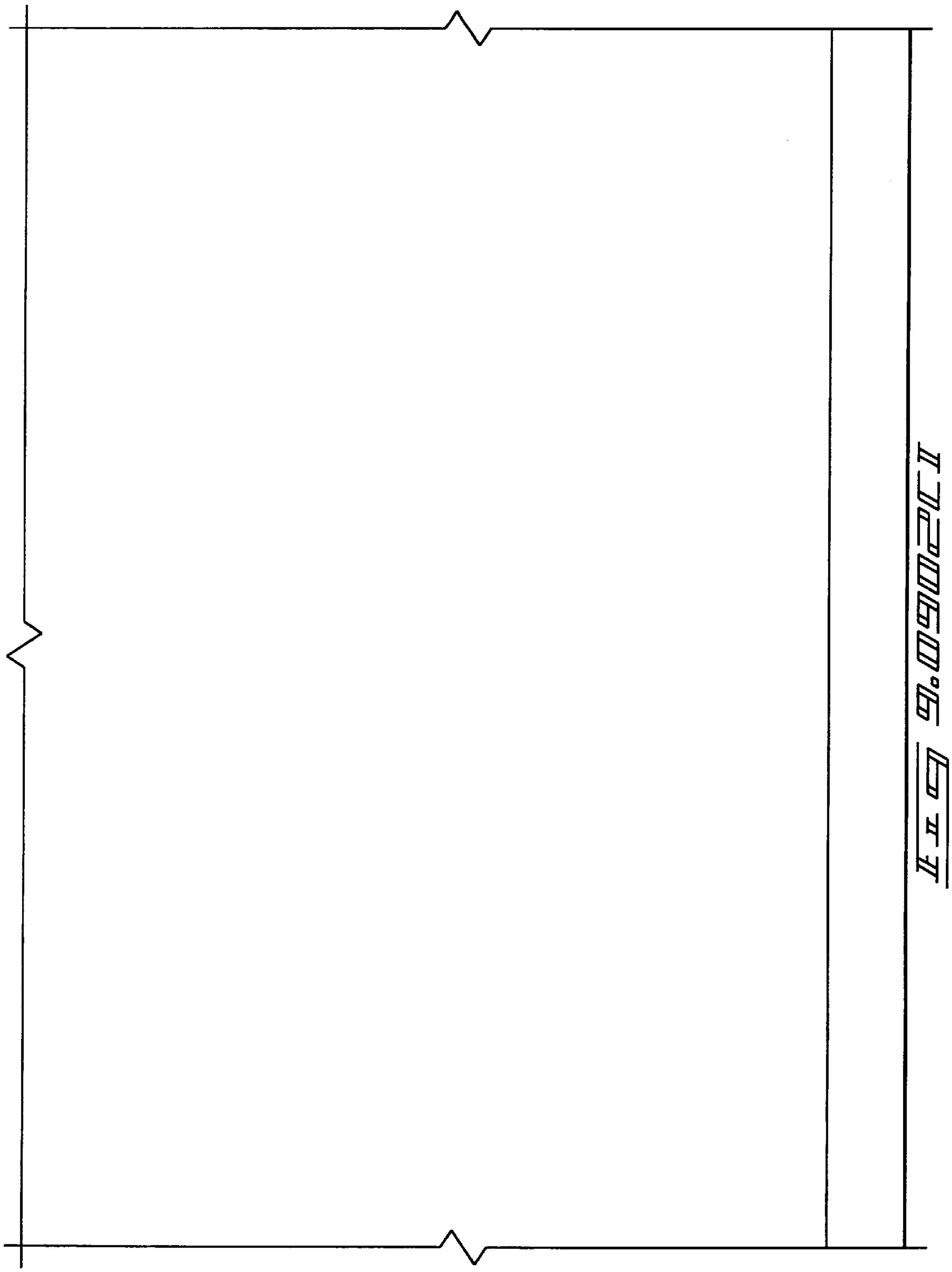
FIG. 9.0902LI

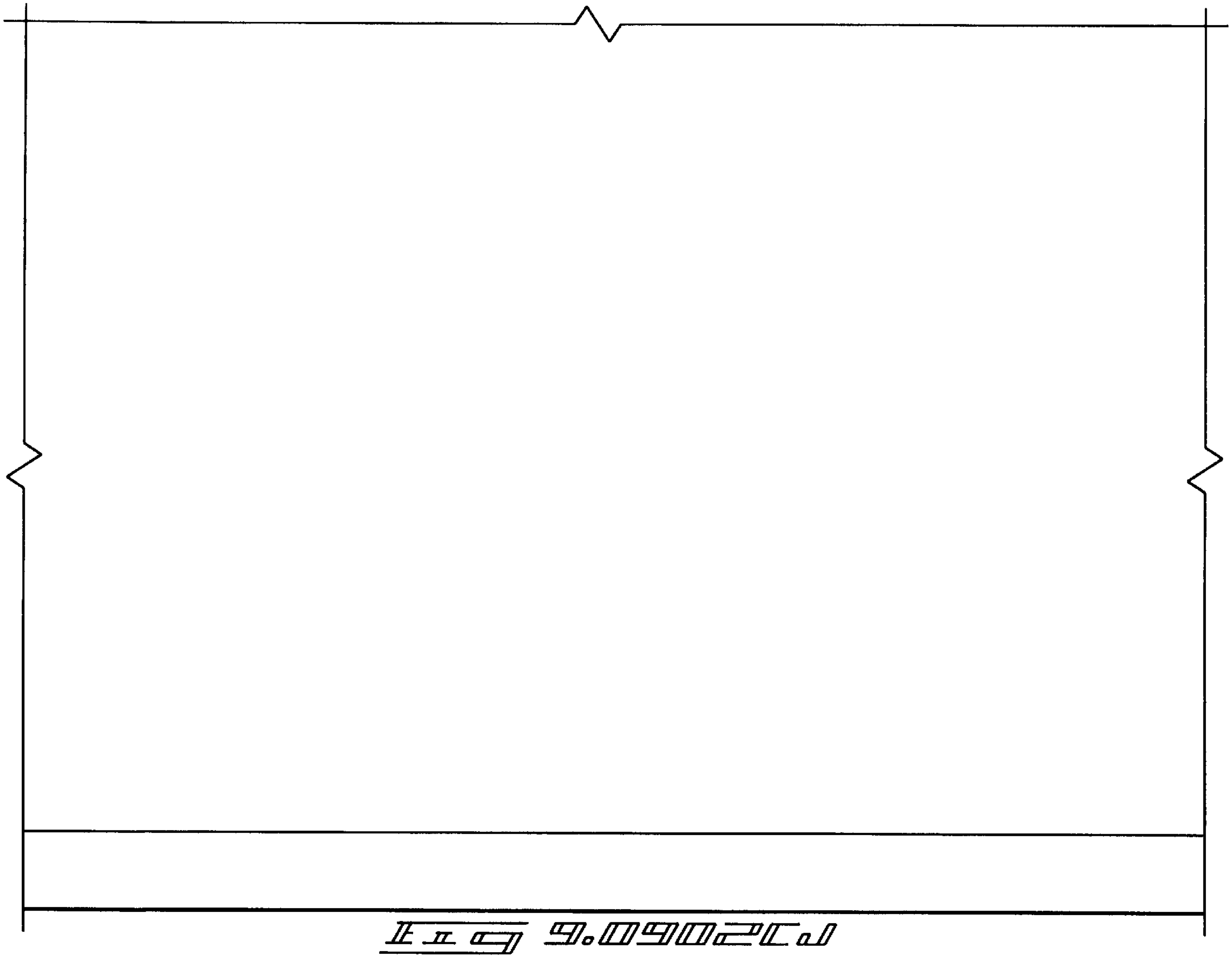
Fig 9.0902CJ

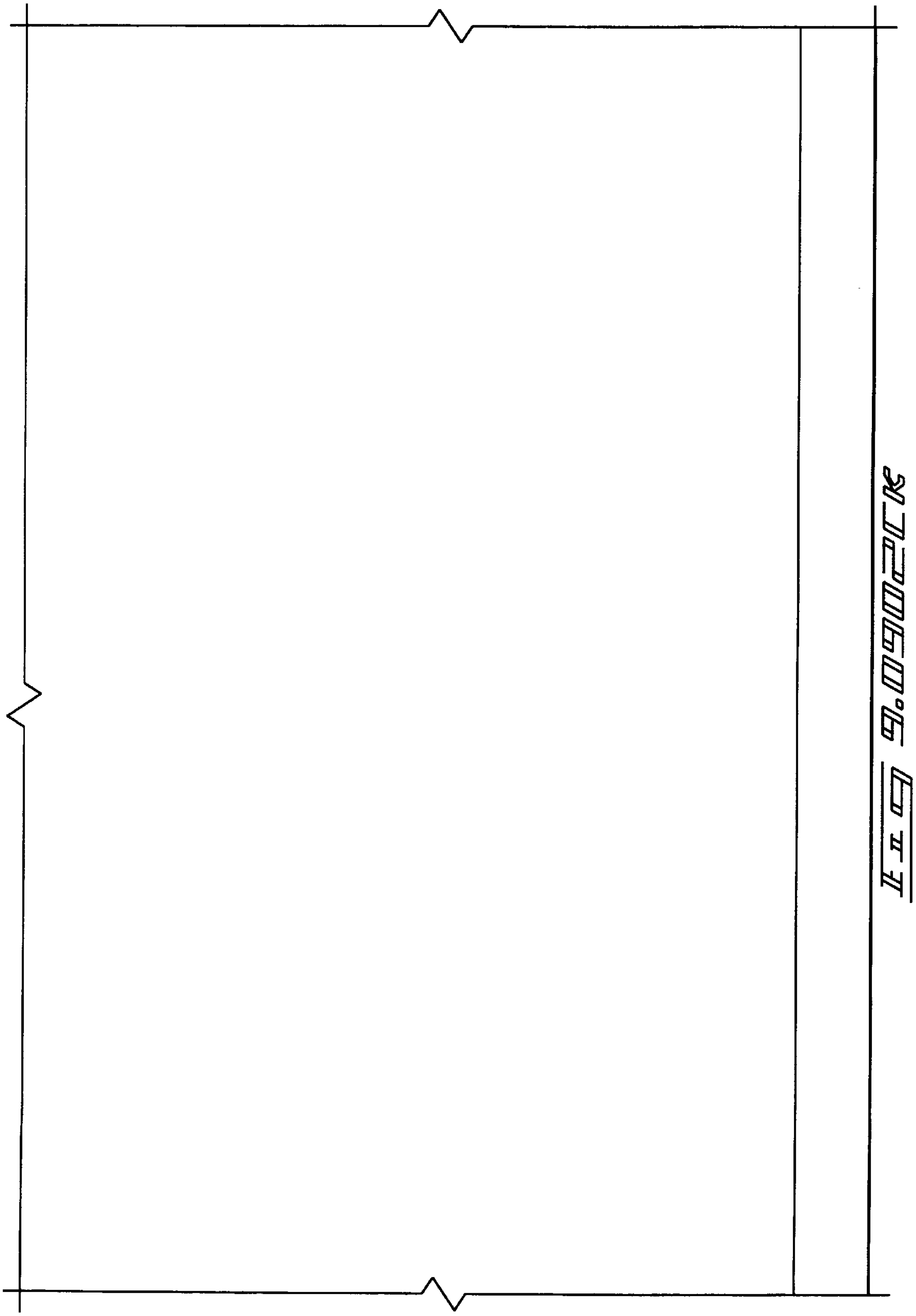
FIG. 9.0902CK

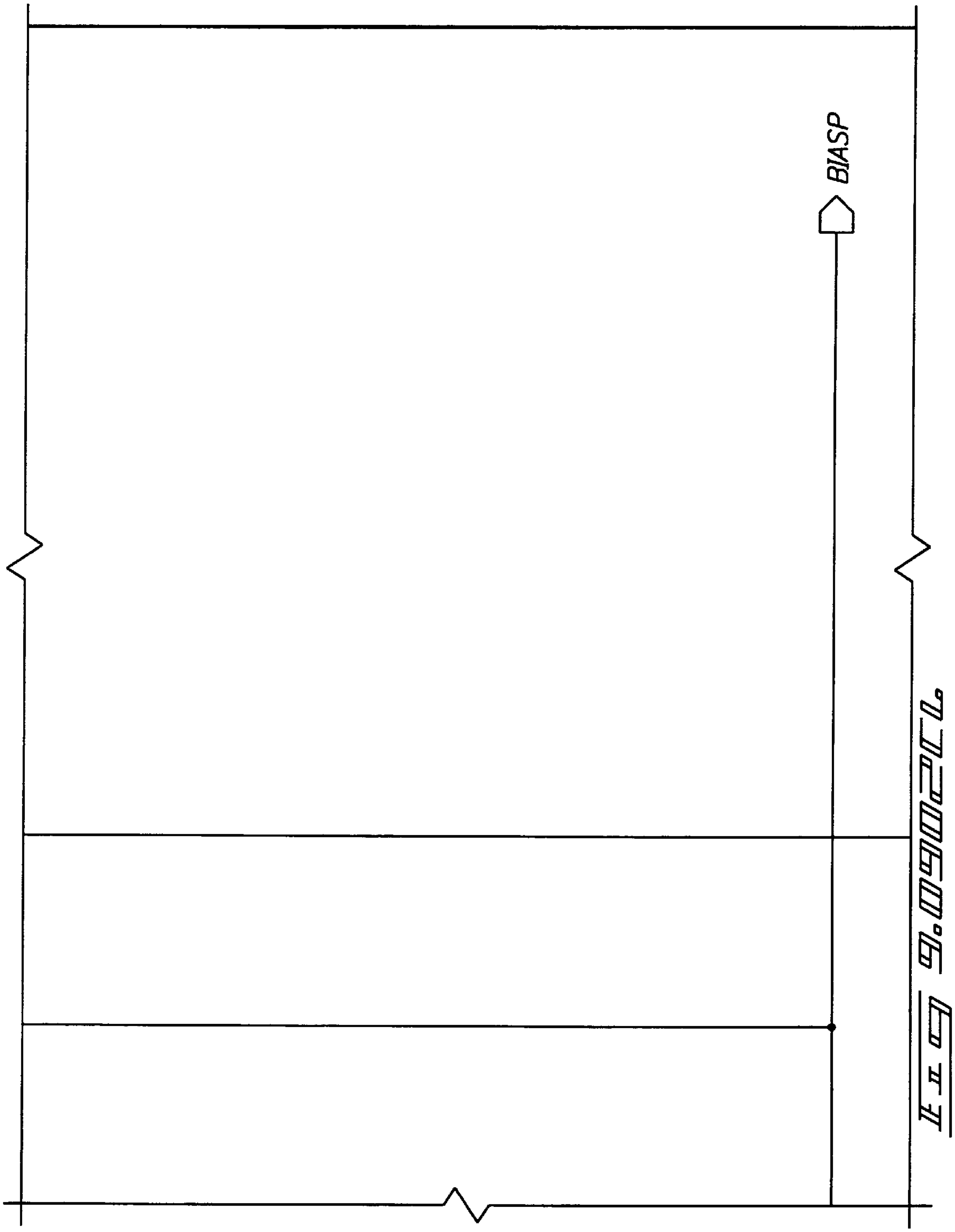
FIG. 9.0902L

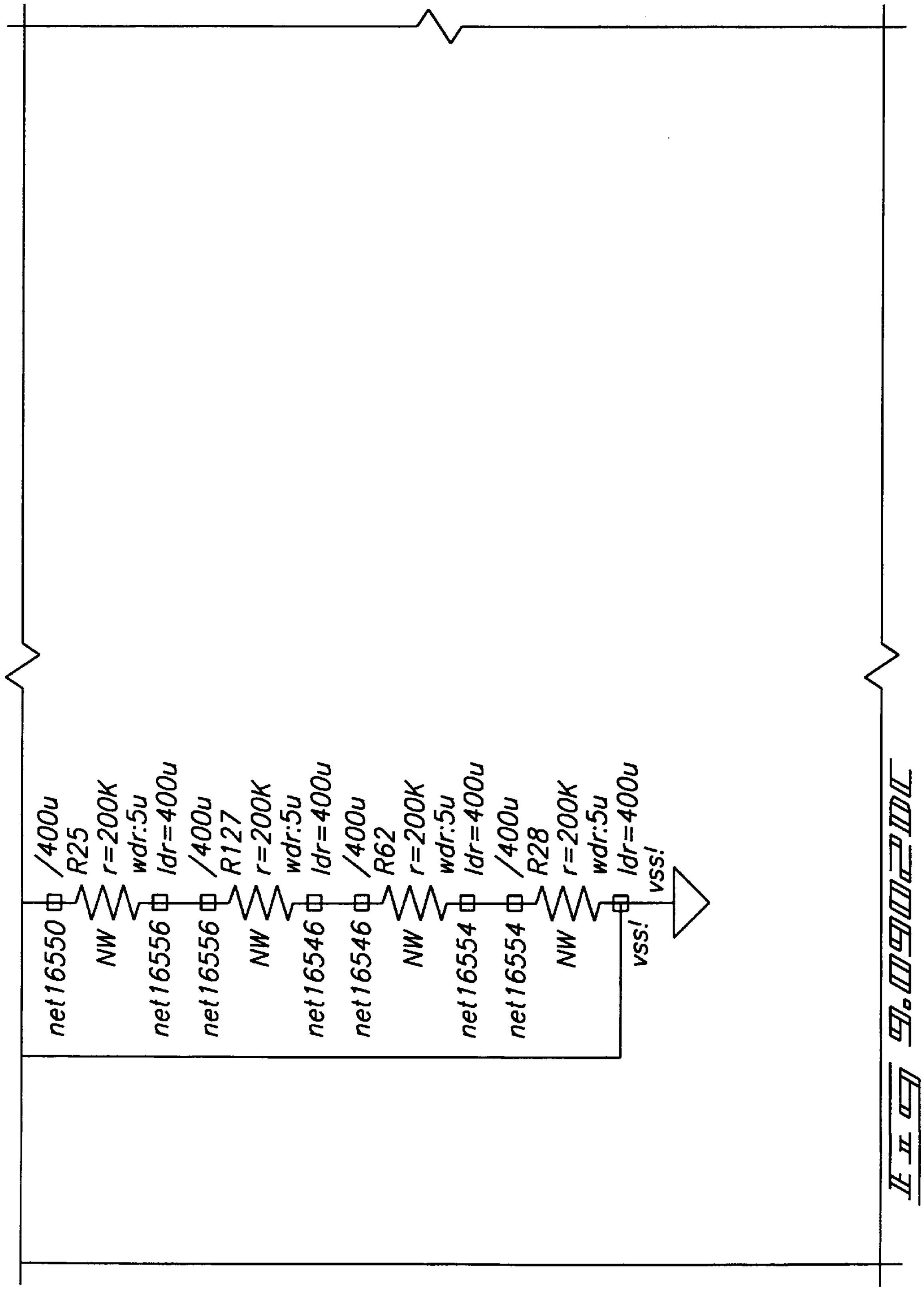
Fig. 9.090ZDC

FIG. 9.090200

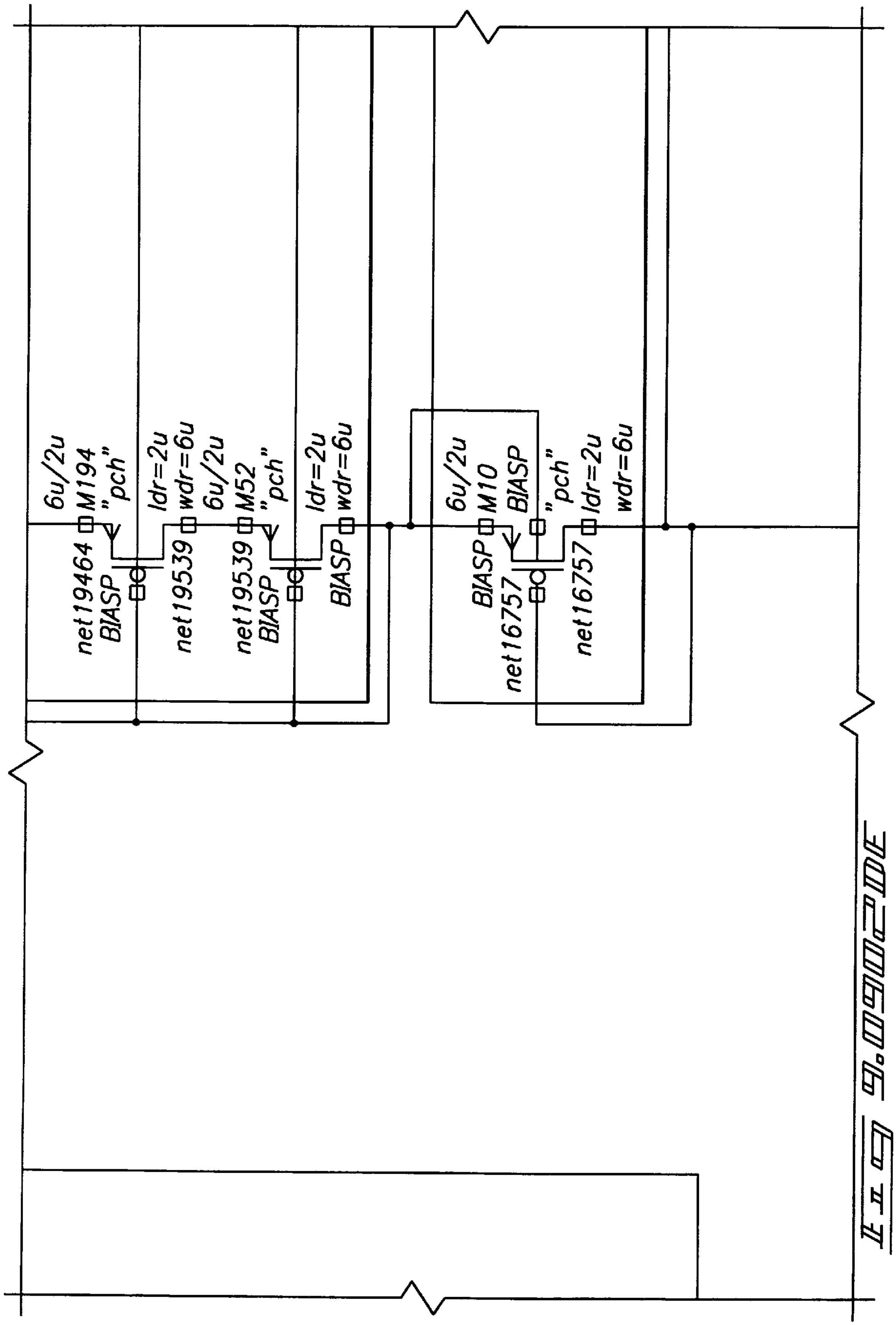
FIG. 9.0902DE

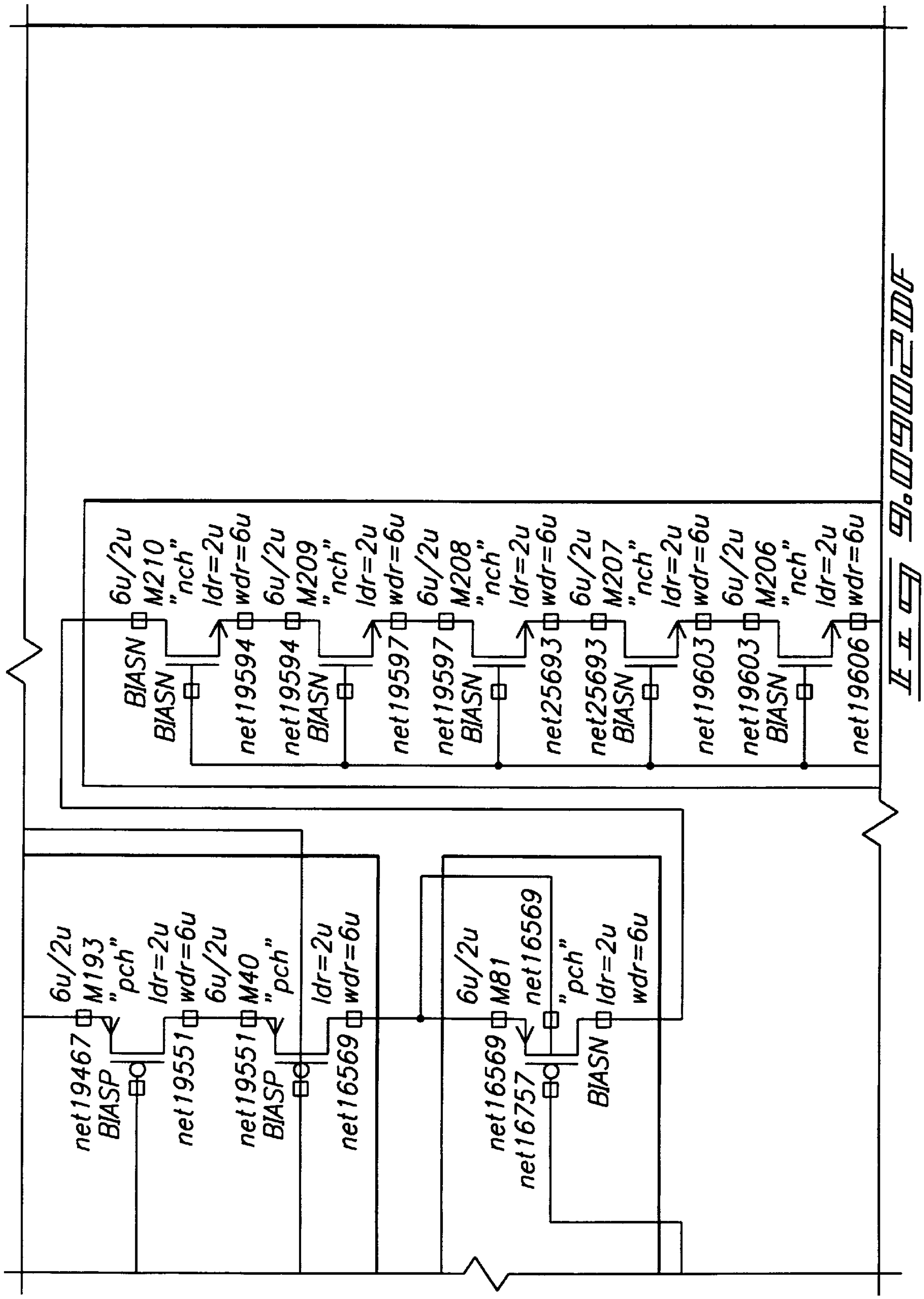
Fig. 9.090.2DF

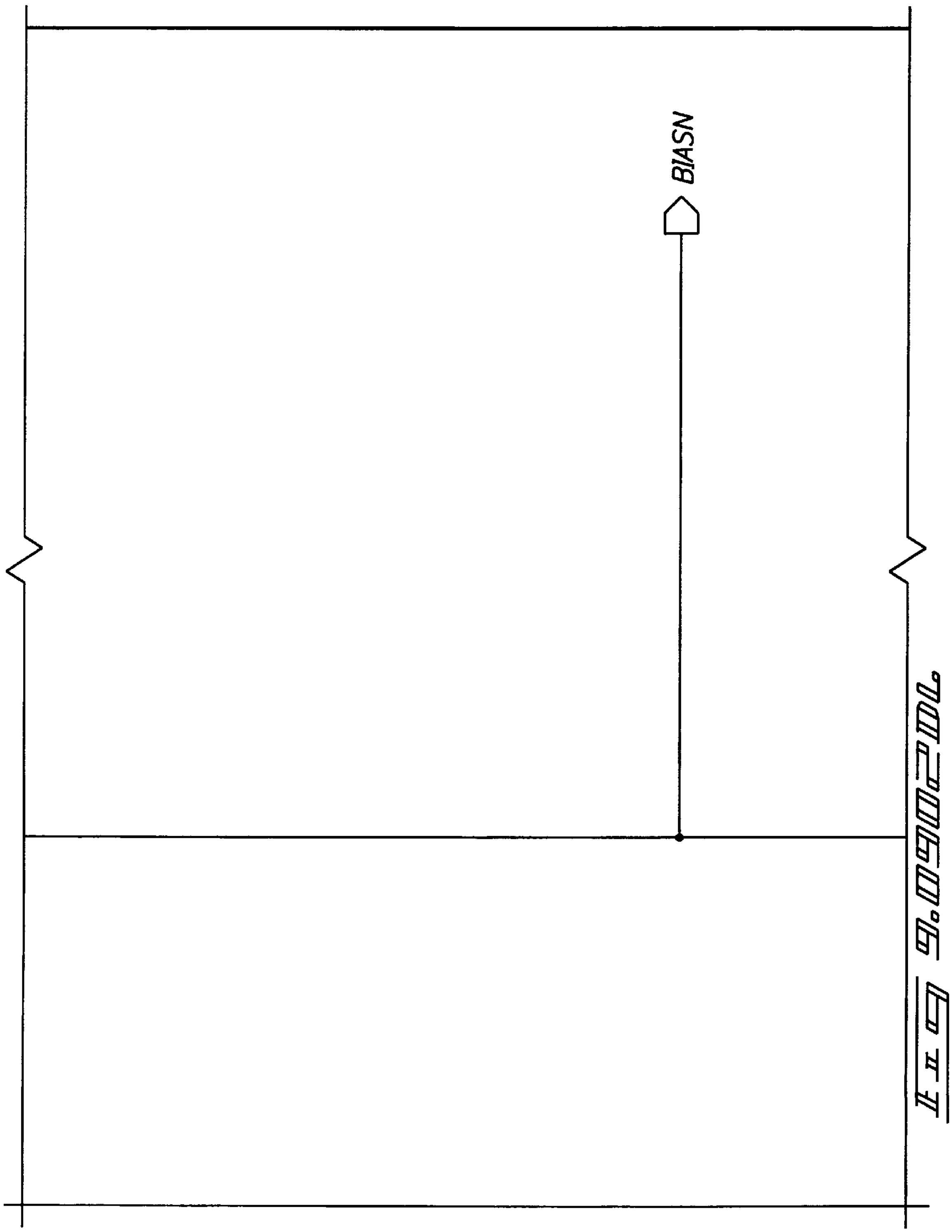
FIG. 9.0902ML

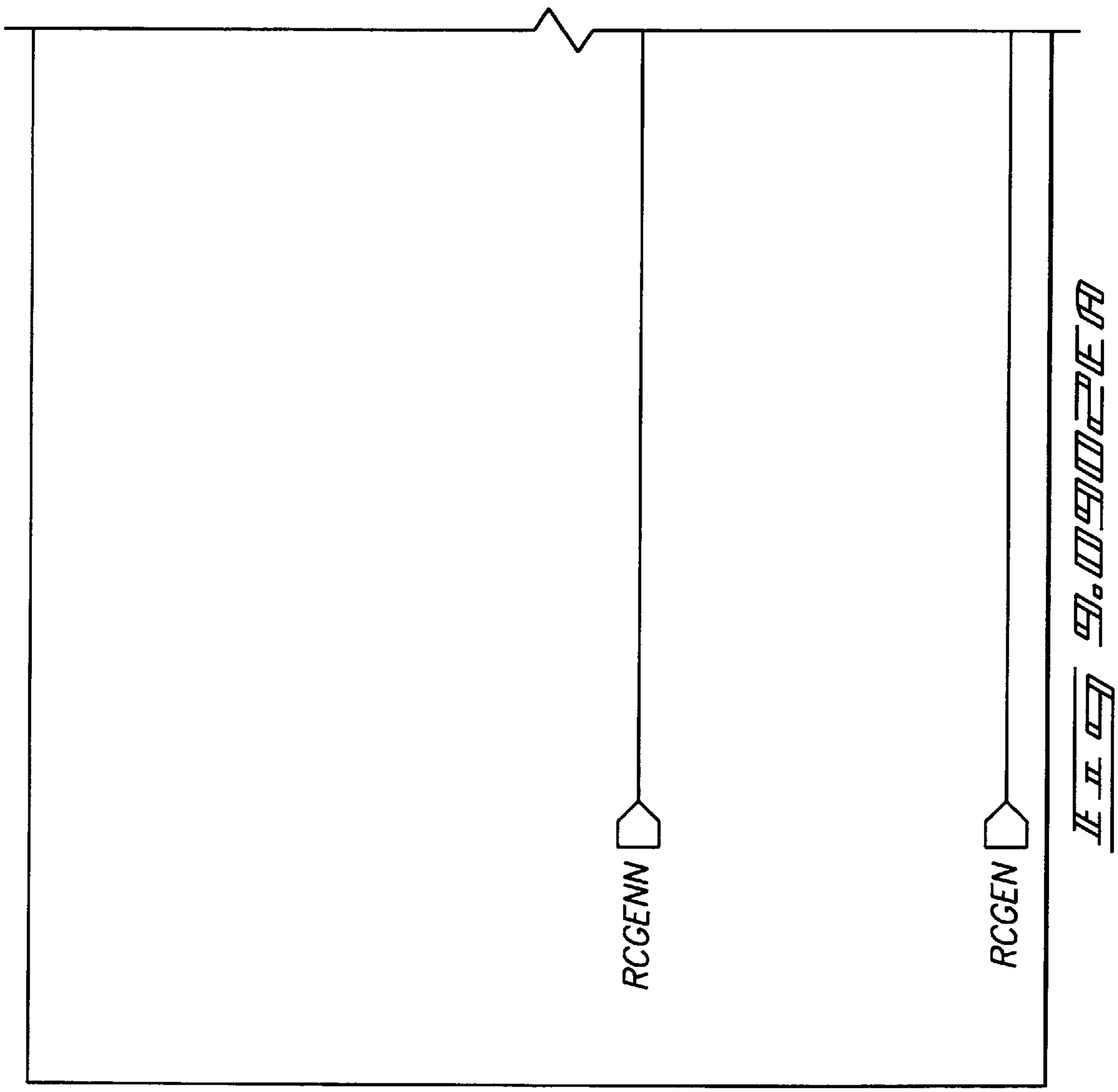
FIG. 9.090ZEA

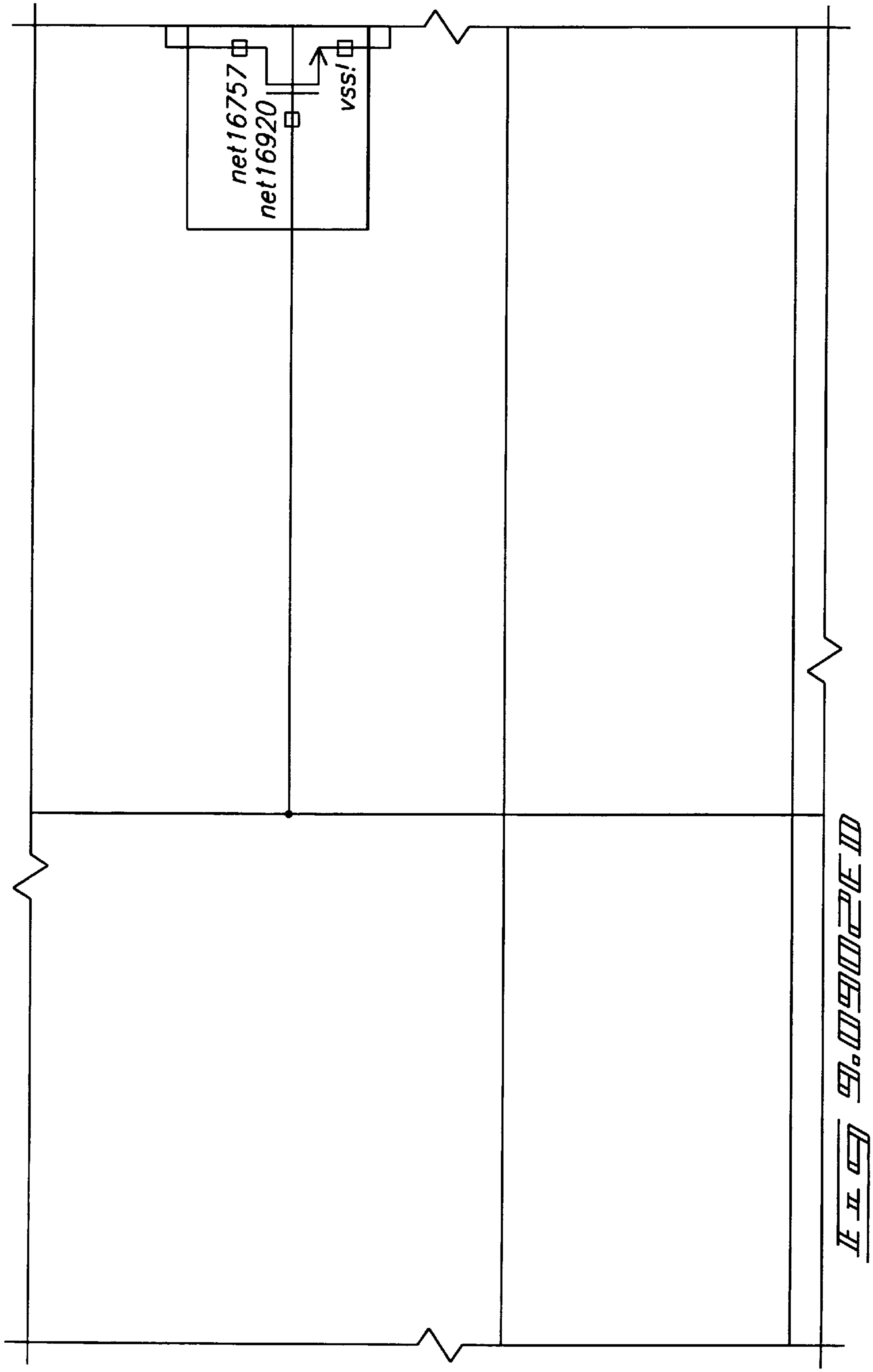
Fig. 9.0902EM

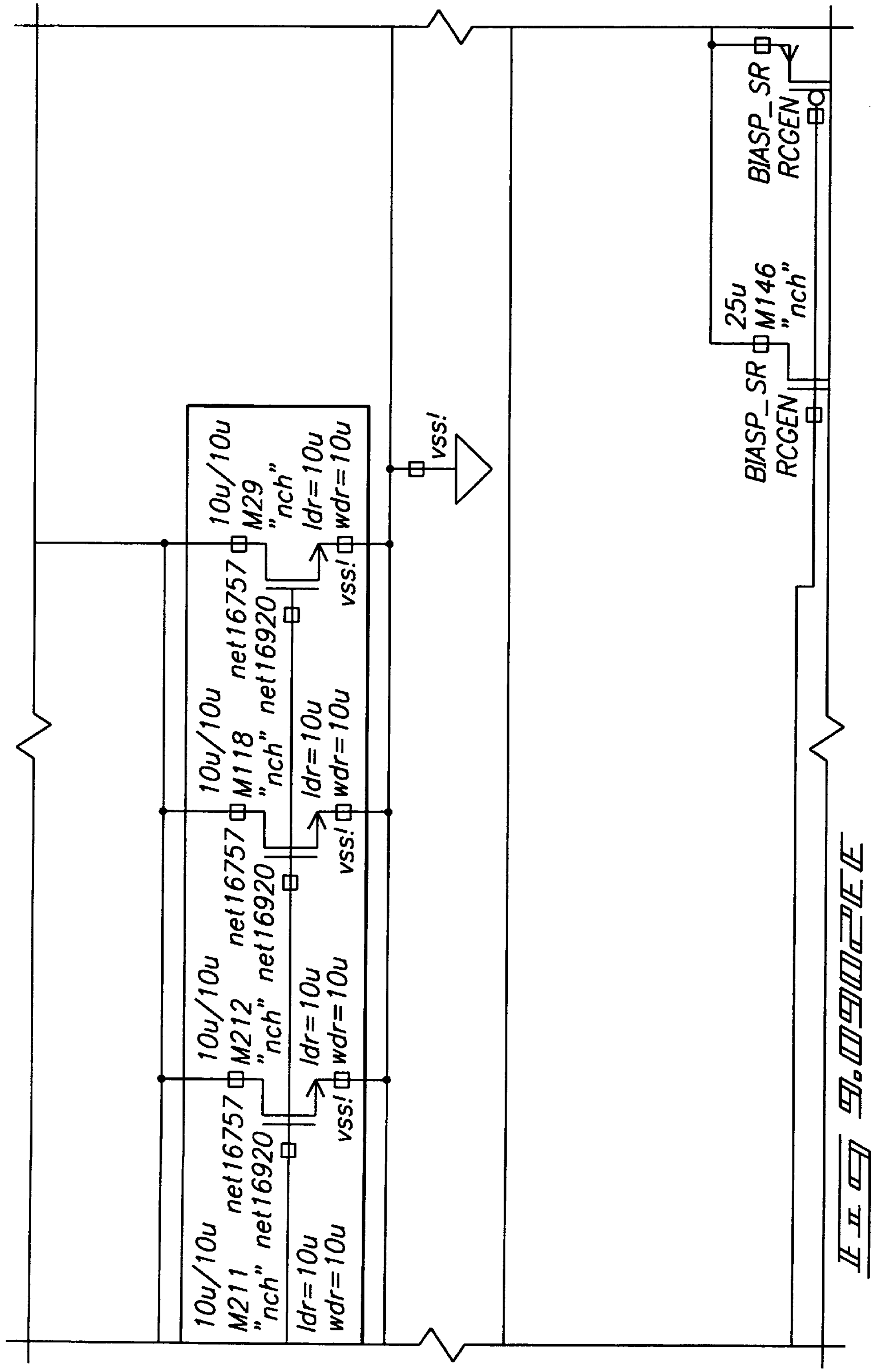
FIG. 9.090ZEE

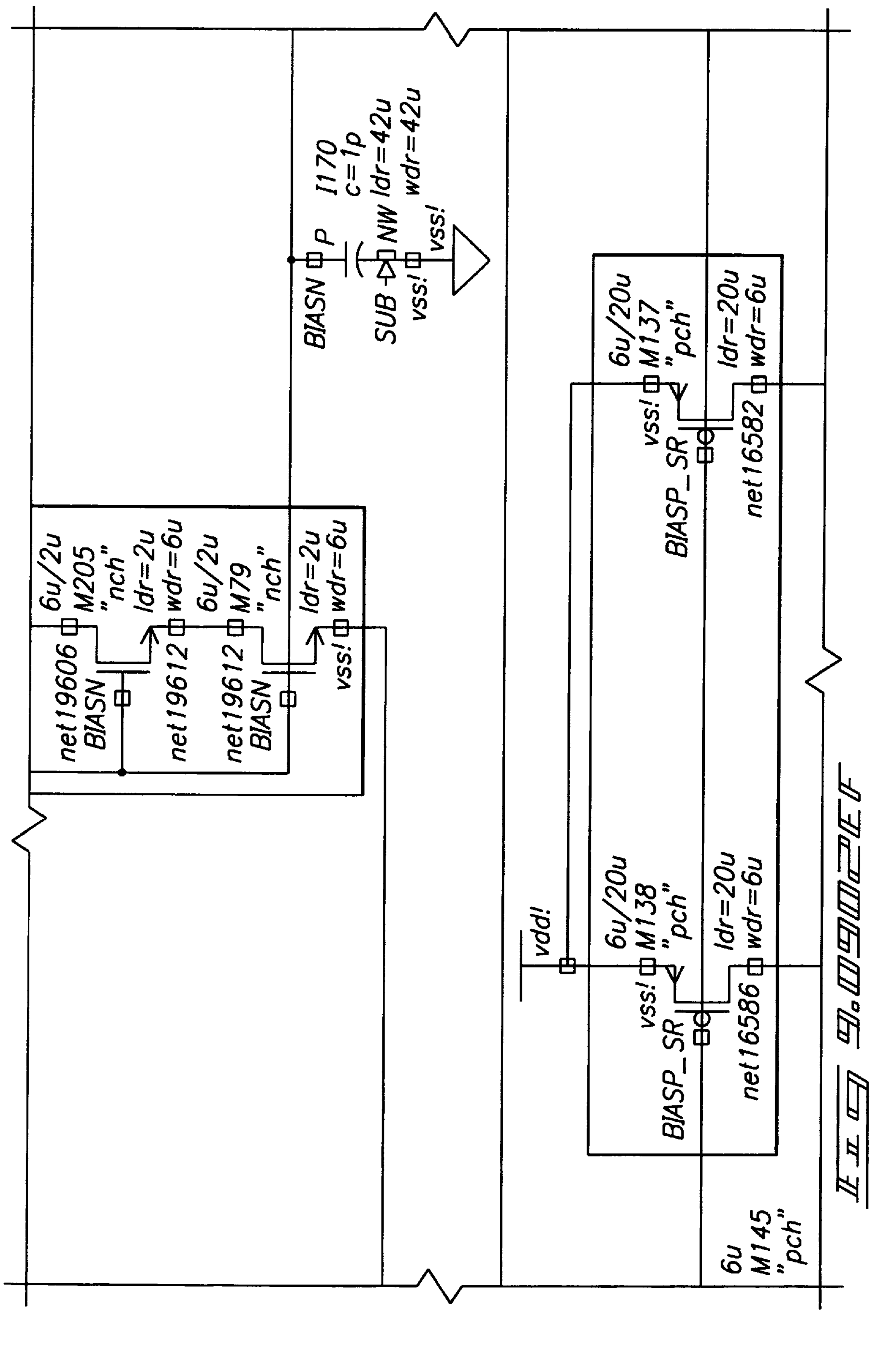
I170
c=1p
ldr=42u
wdr=42u
BIASN
P
NW
SUB
vss!
6u/2u
M205
"nch"
ldr=2u
wdr=6u
6u/2u
M79
"nch"
ldr=2u
wdr=6u
net19606
BIASN
net19612
net19612
BIASN
vss!
6u/20u
M137
"pch"
ldr=20u
wdr=6u
vss!
BIASP_SR
net16582
vdd!
6u/20u
M138
"pch"
ldr=20u
wdr=6u
vss!
BIASP_SR
net16586
6u
M145
"pch"

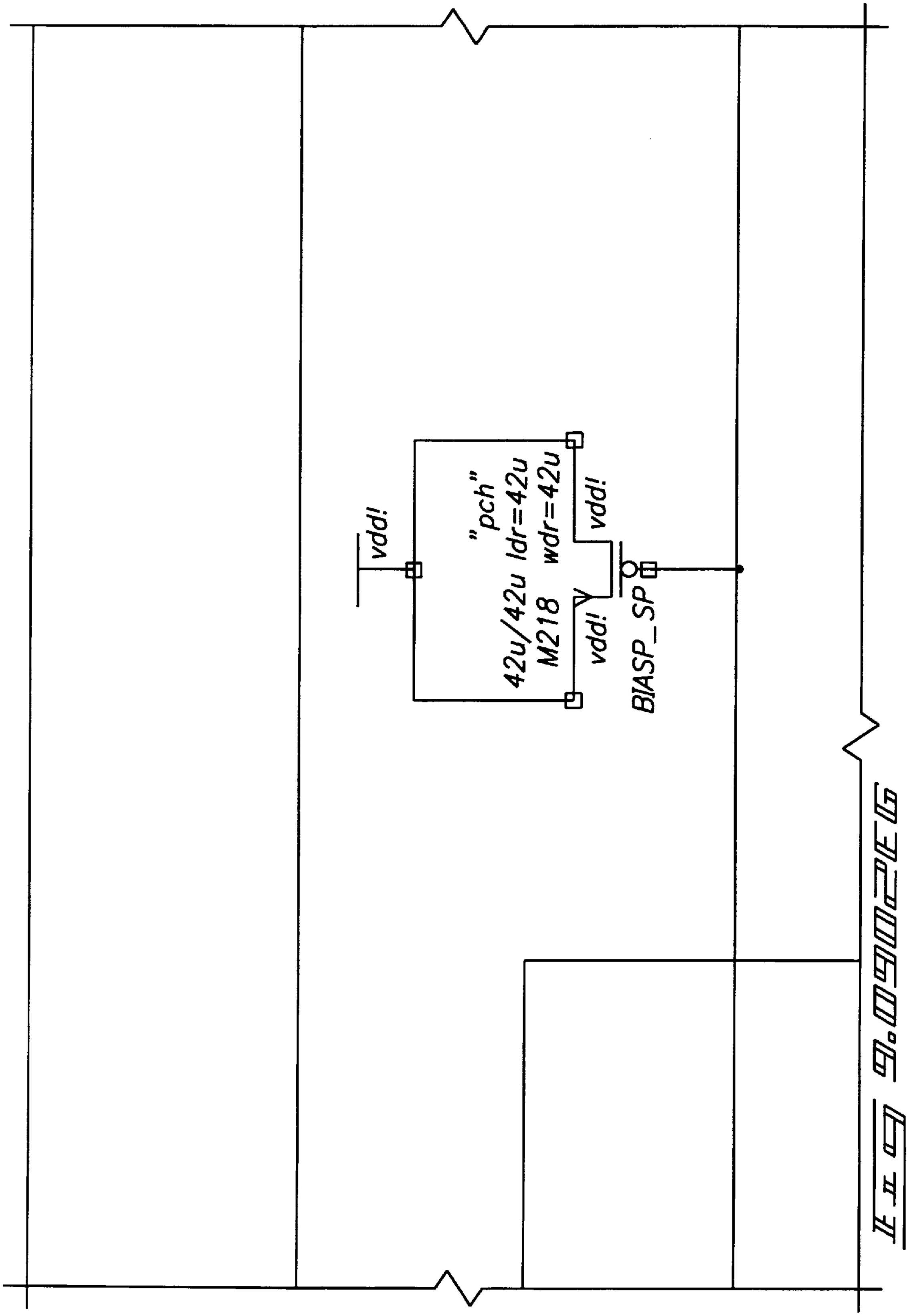
FIG. 9.0902EG

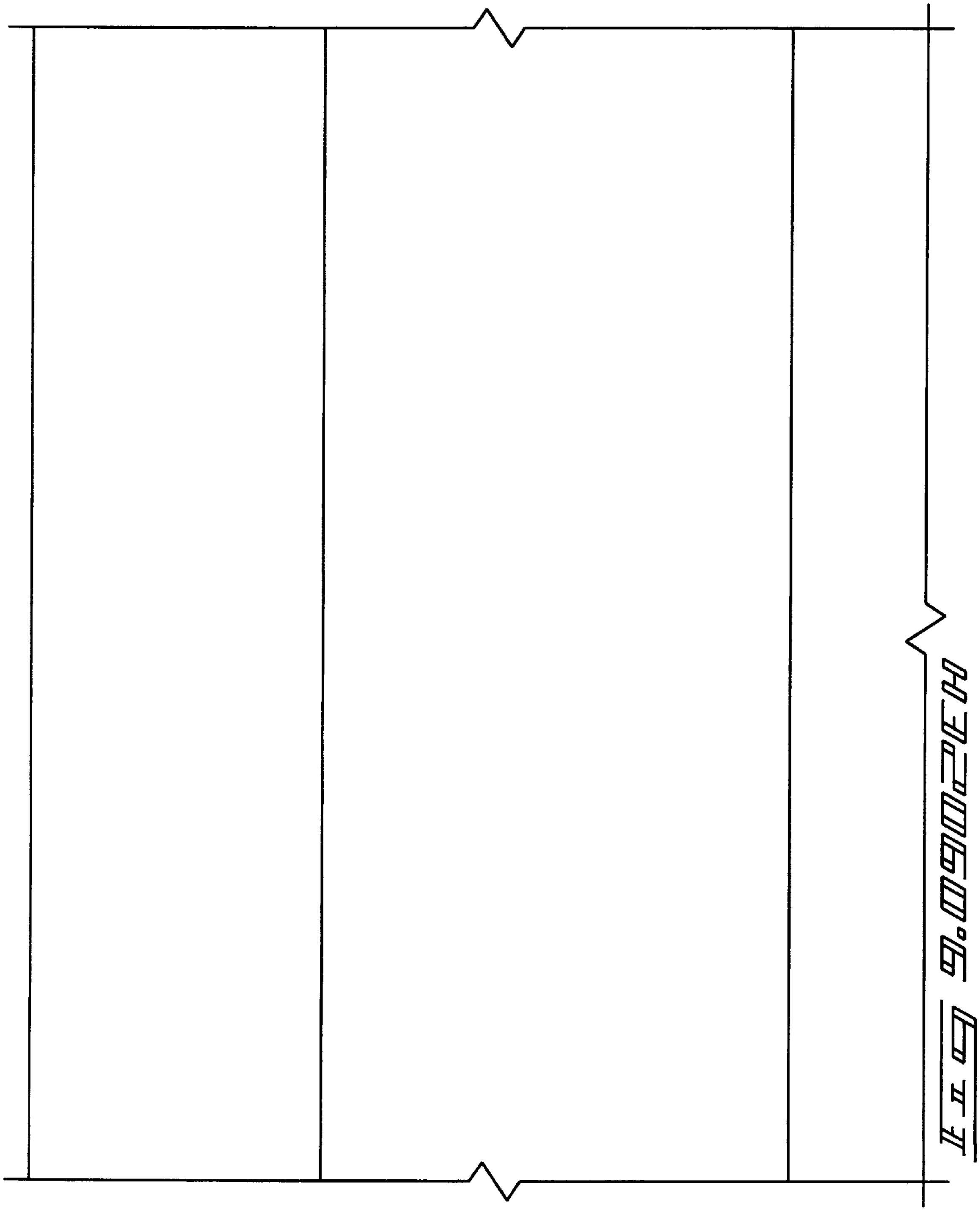
FIG. 9.090ZEH

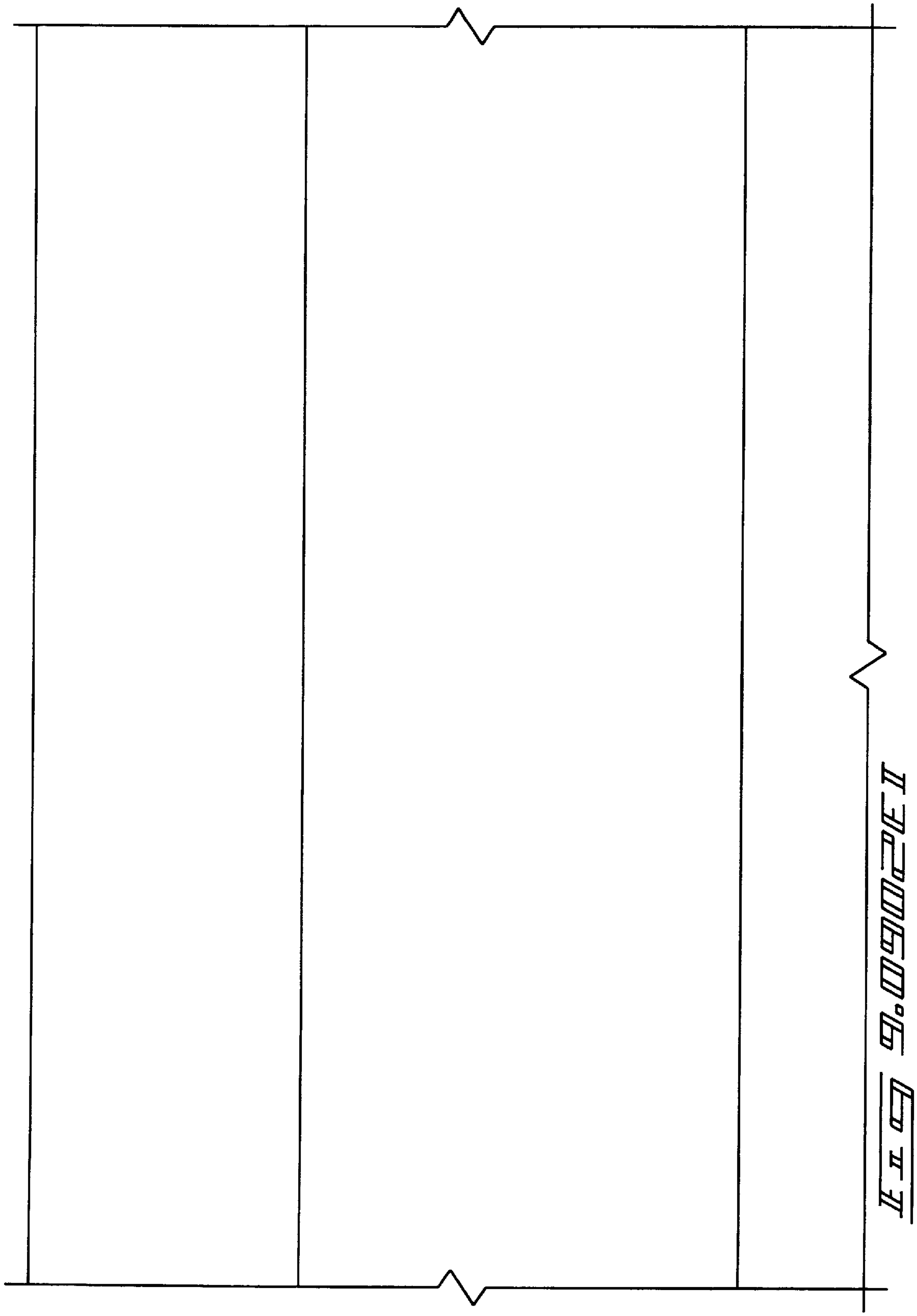
FIG. 9.0902EI

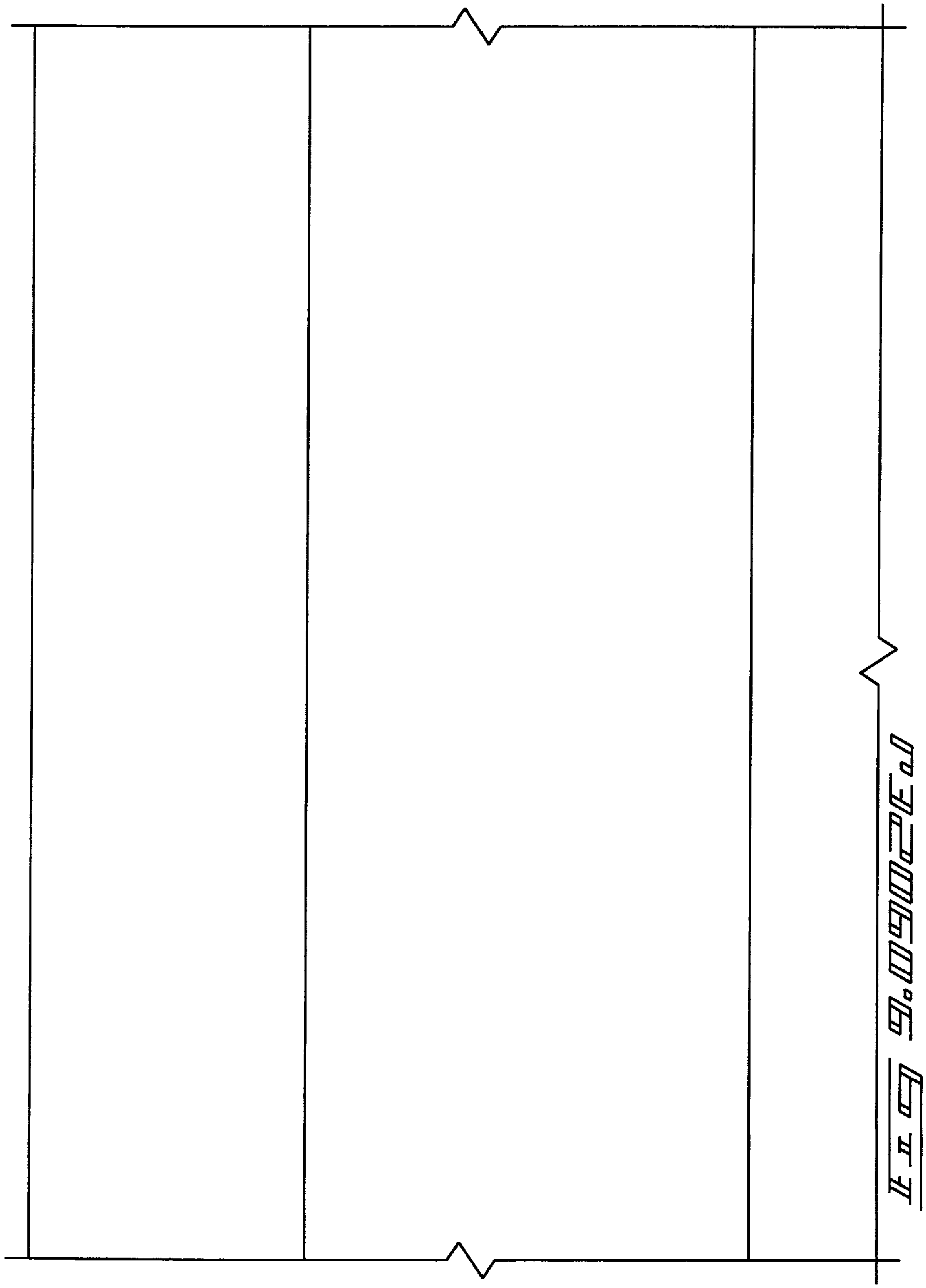
FIG. 9.090ZEJ

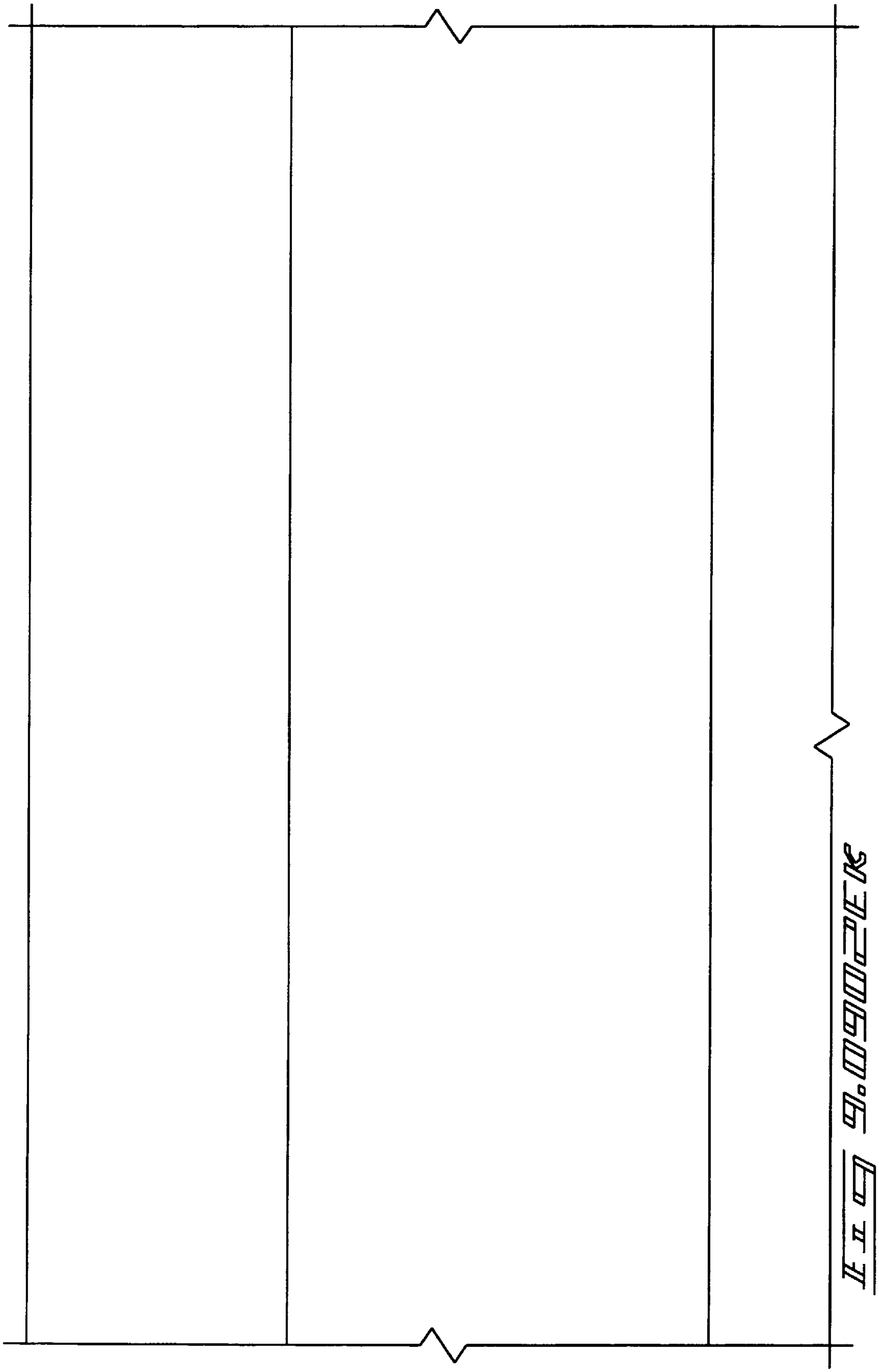
FIG. 9.0902EK

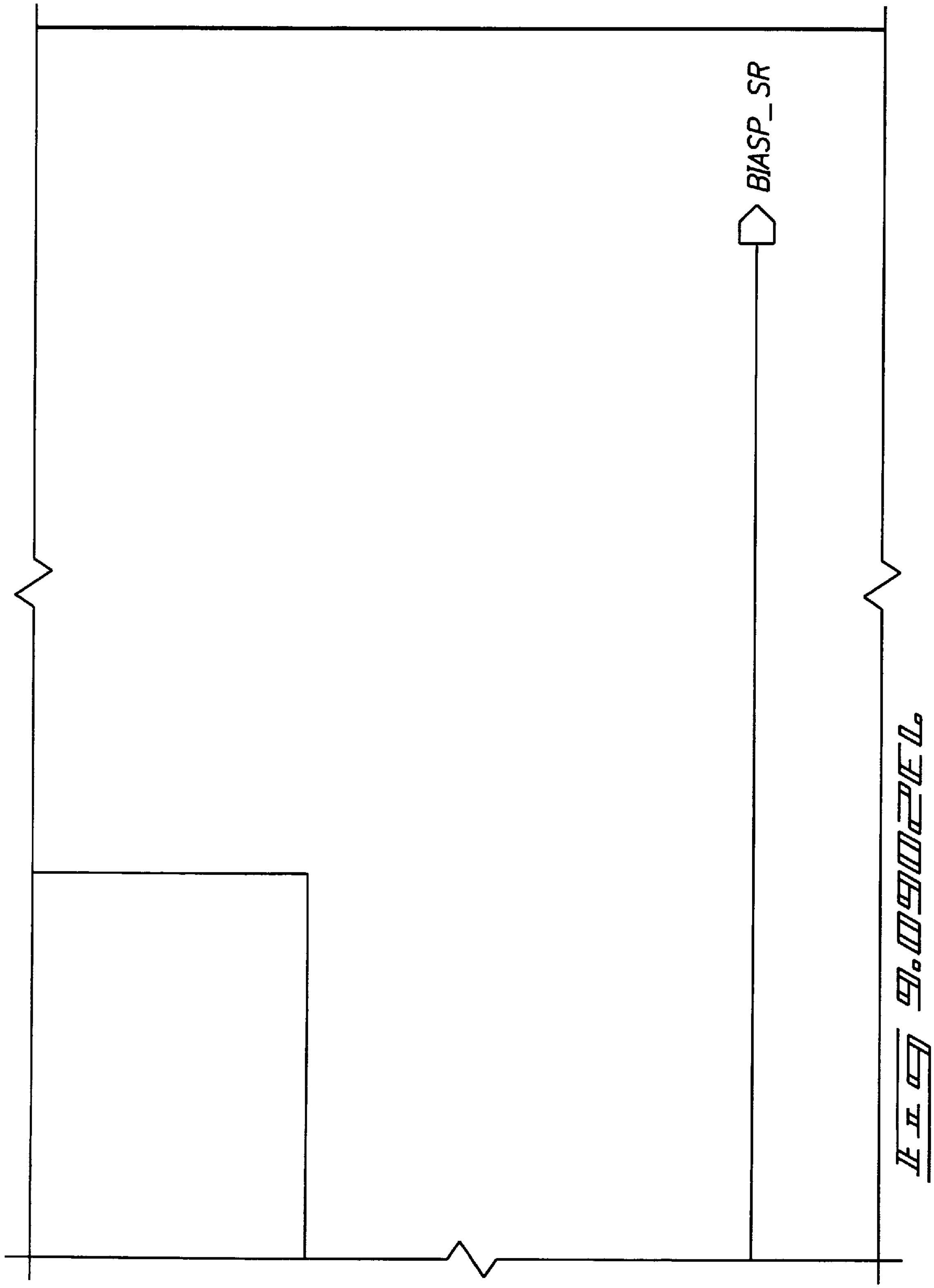
FIG. 9.0902EL

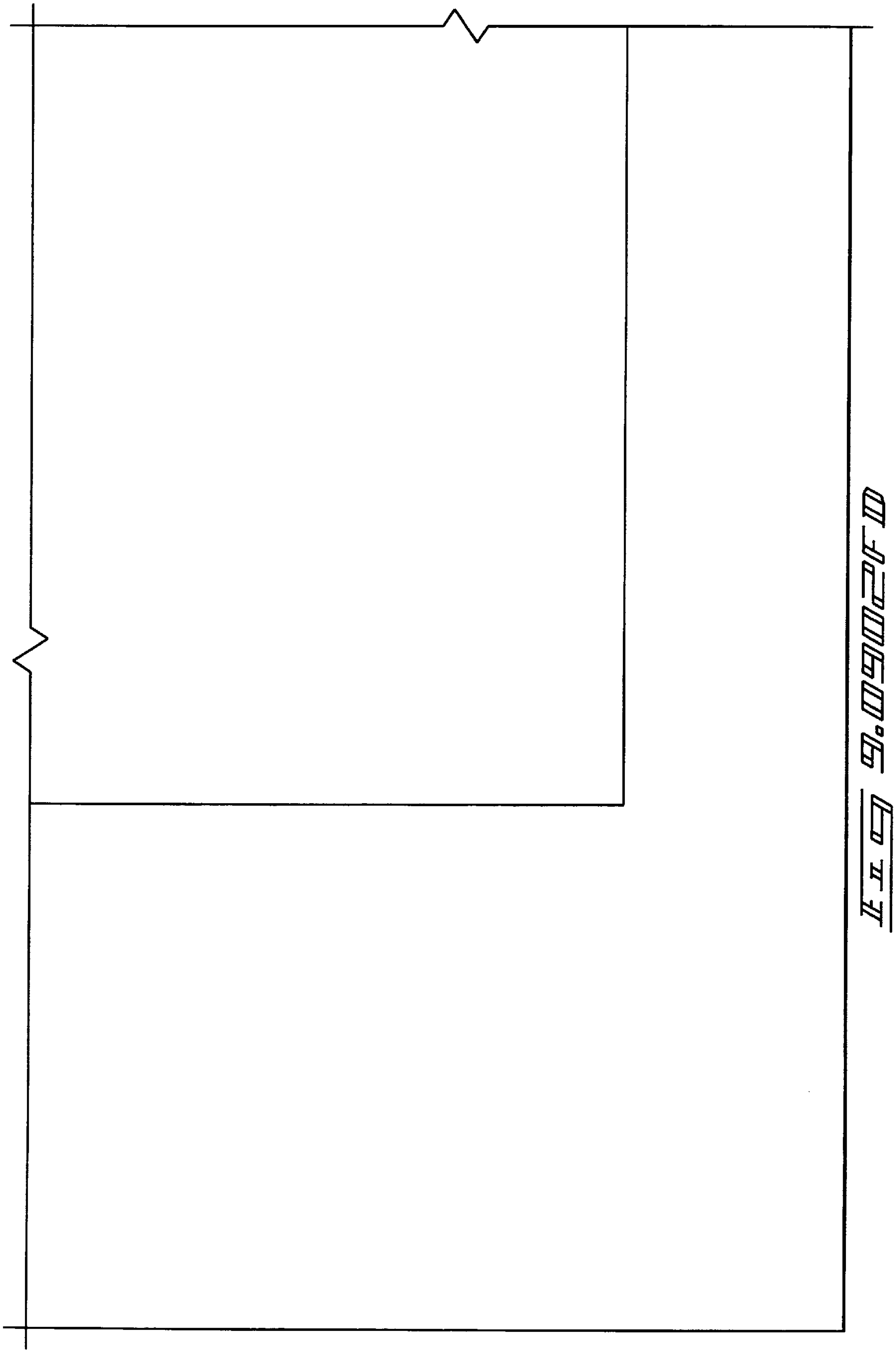
Fig. 9.0902FD

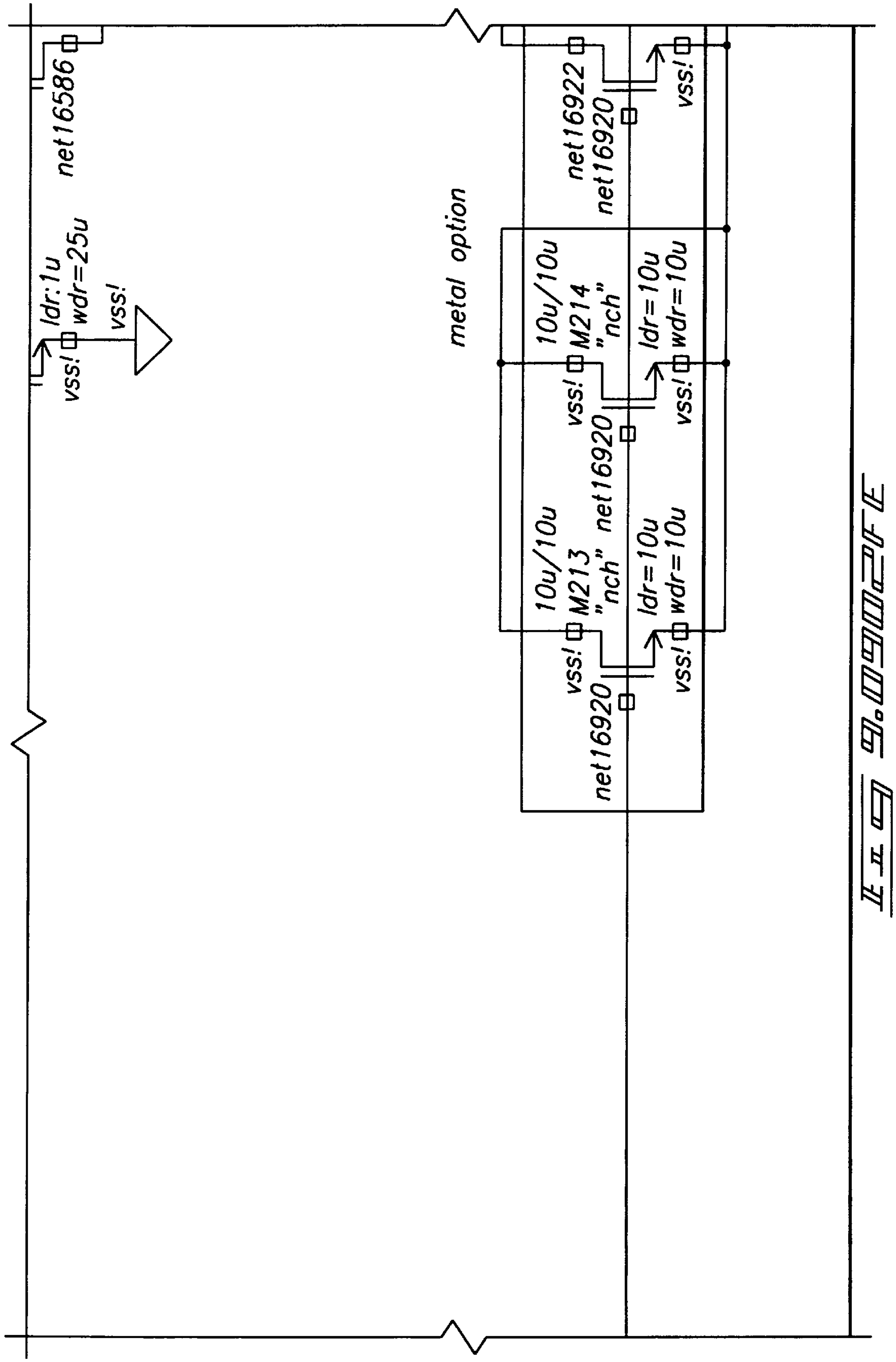
Fig 9.090.2FE

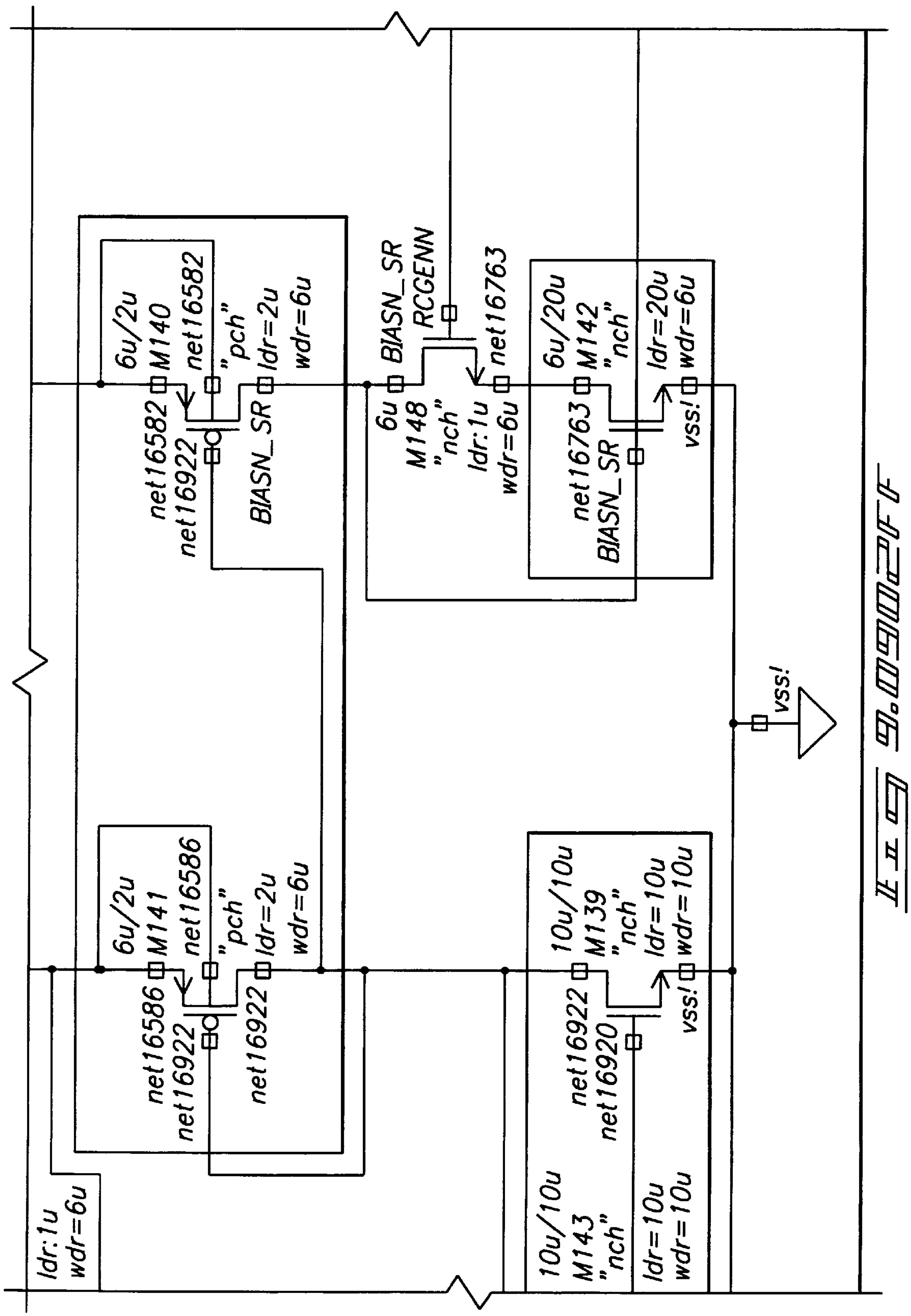
Fig. 9.0902FF

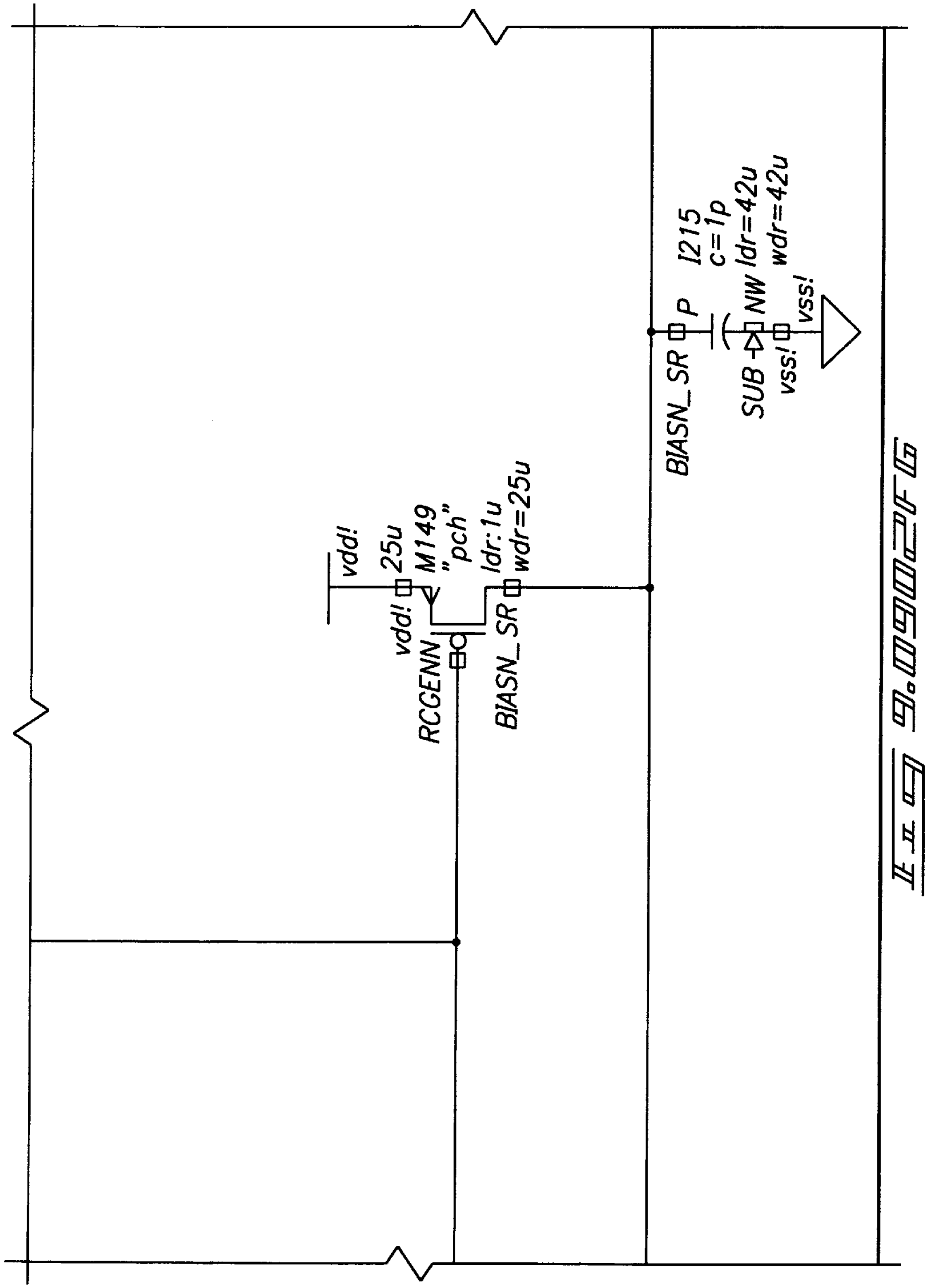
Fig 9.090ZFG

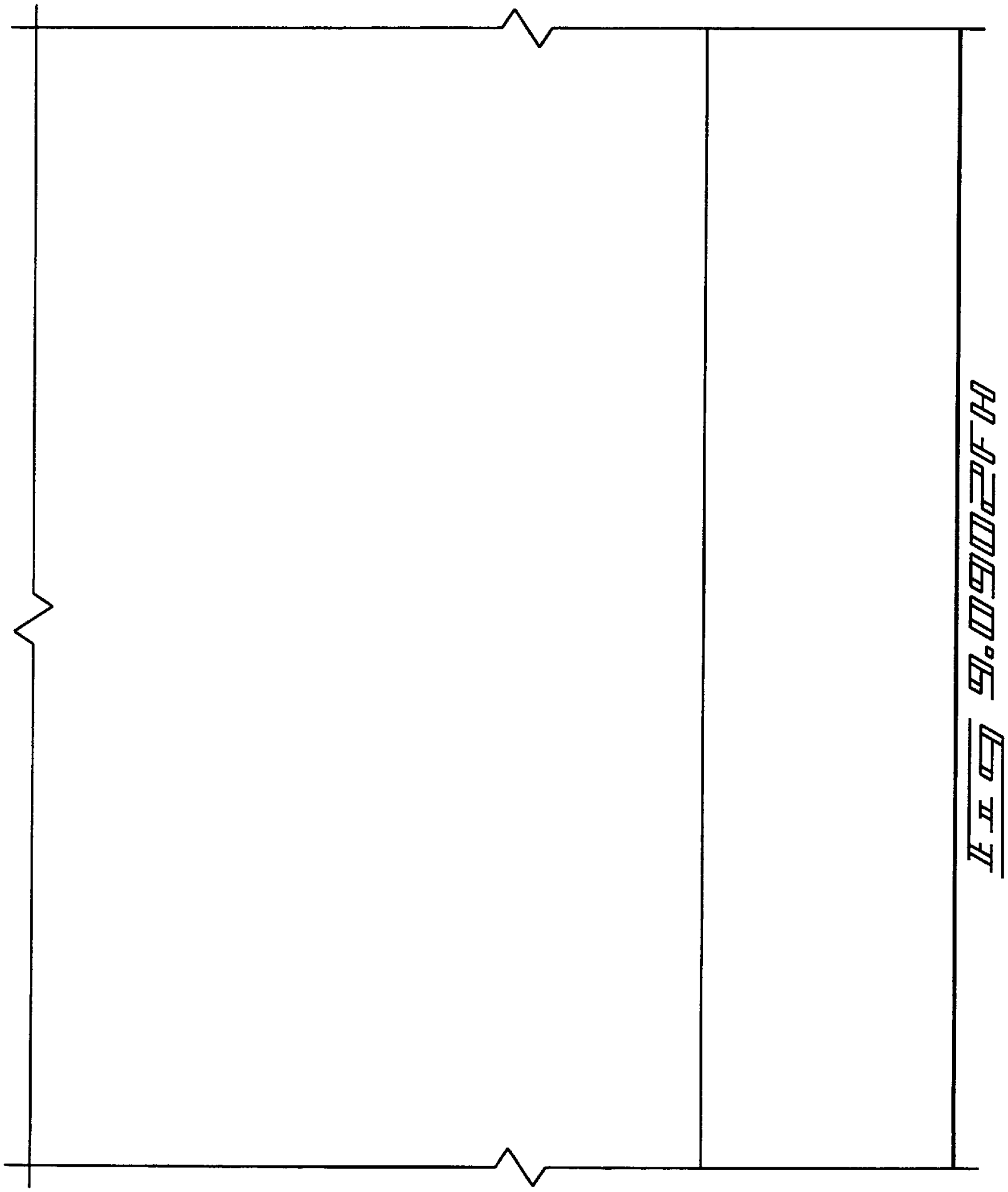
FIG. 9.0902LH

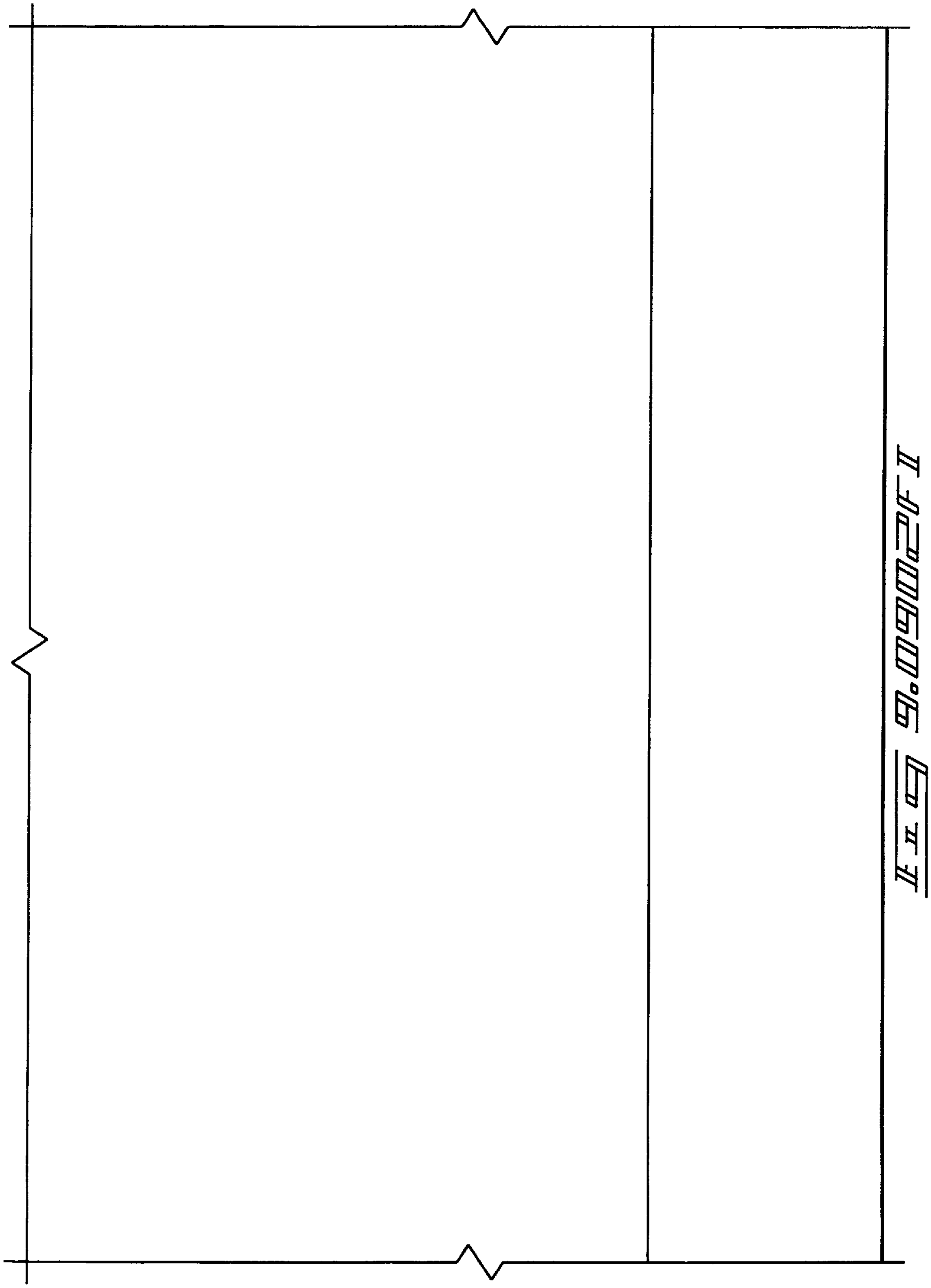
FIG. 9.0902FI

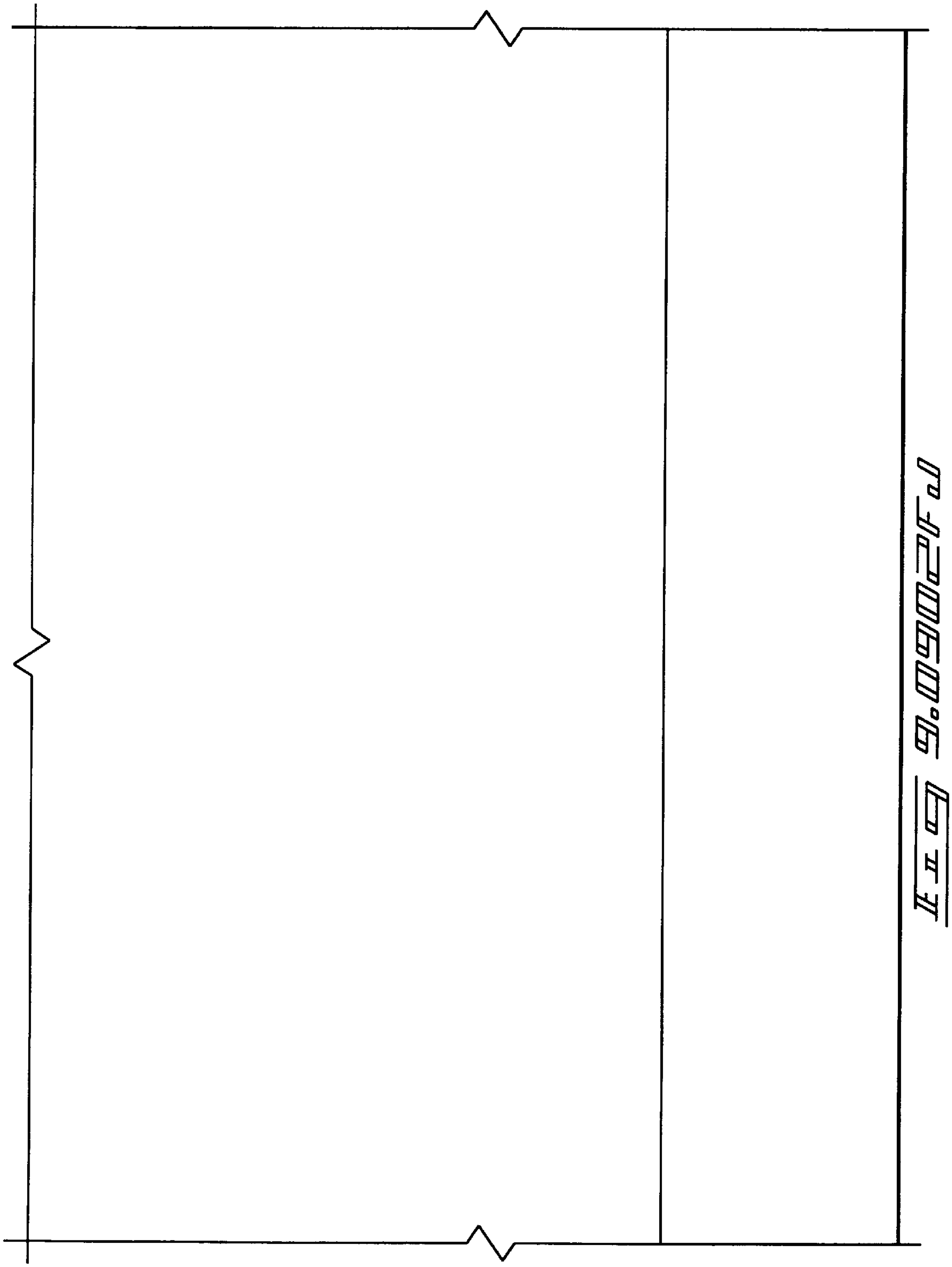
FIG. 9.0902FJ

FIG. 9.0902FK

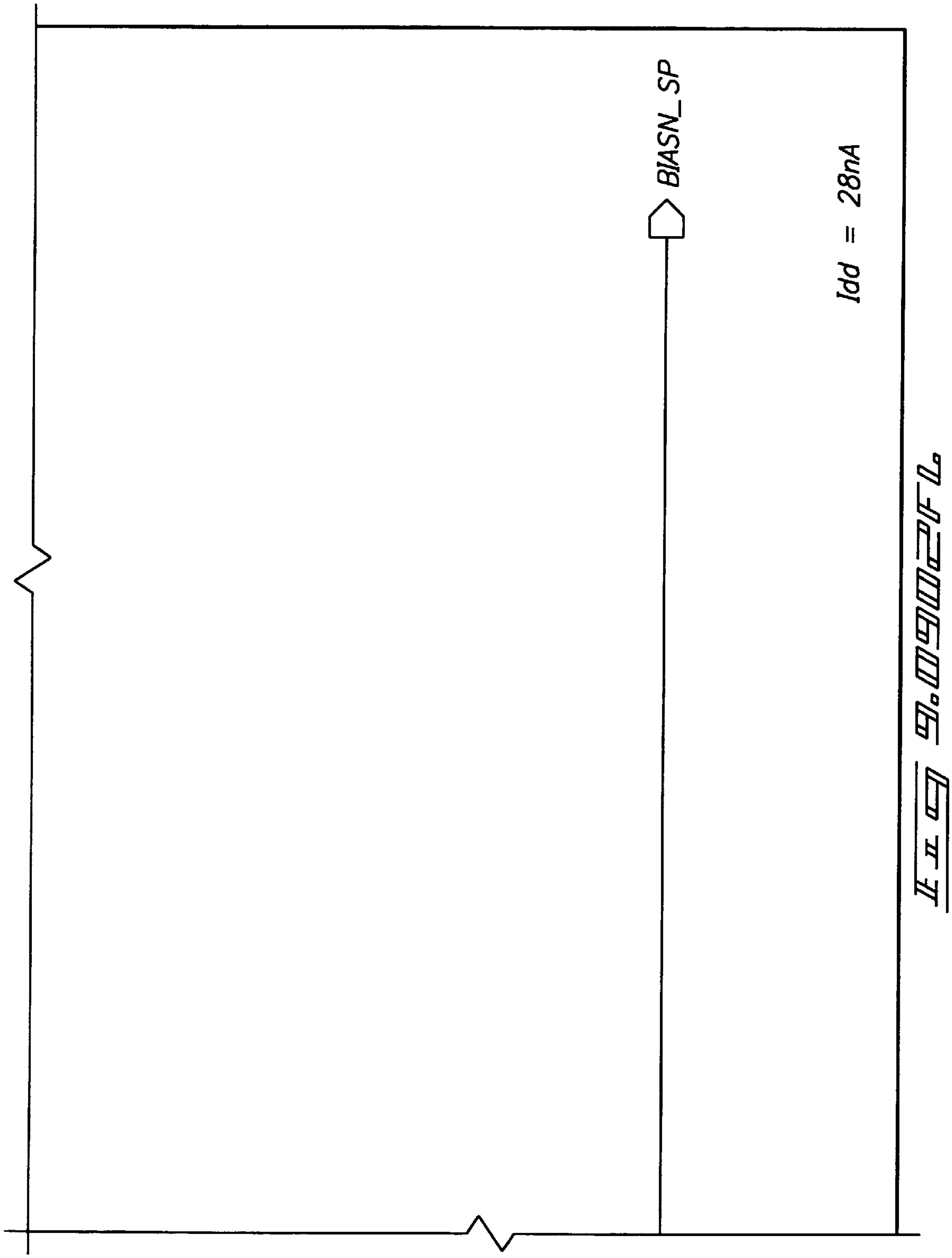
FIG. 9.0902FL

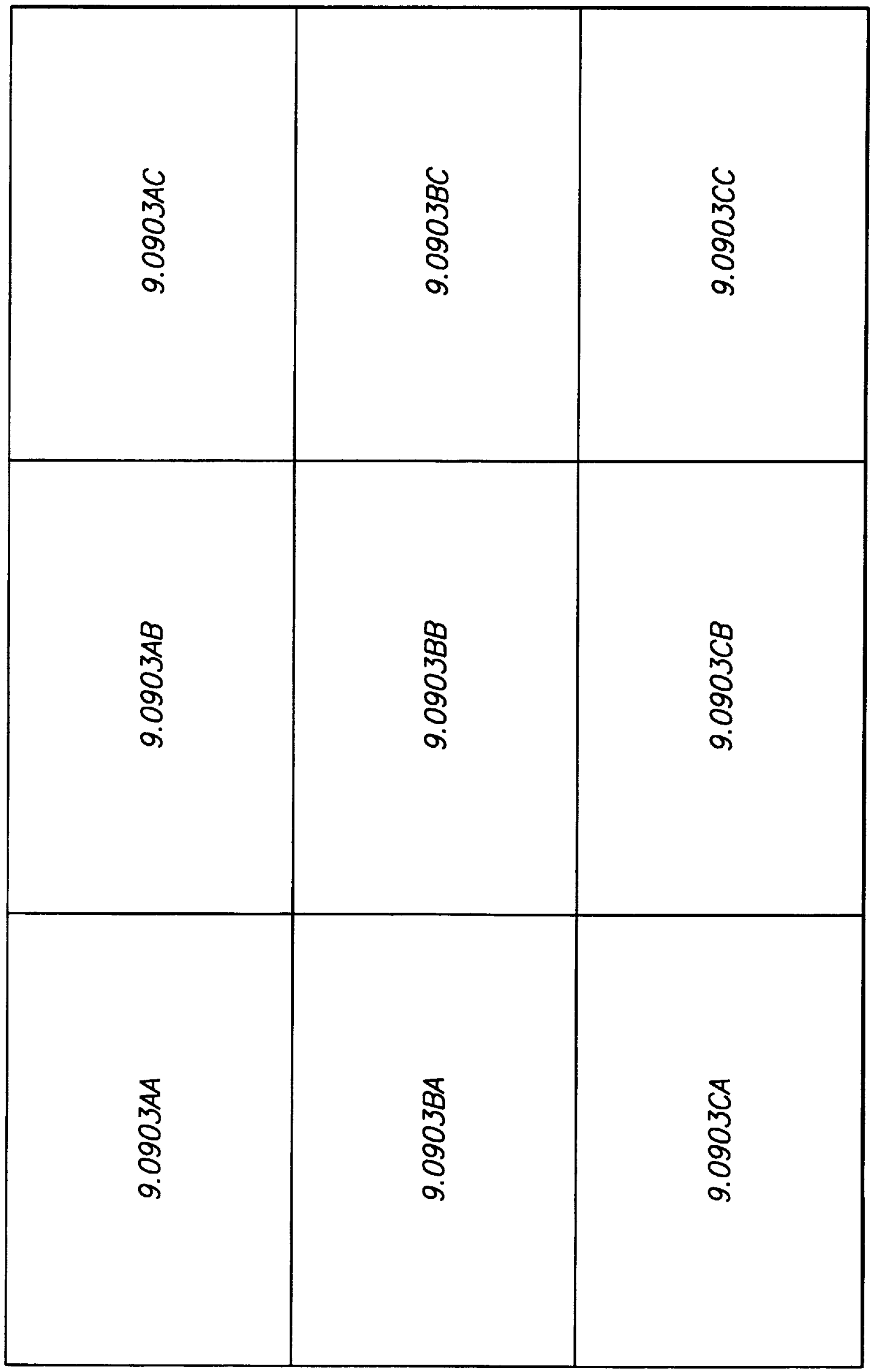
FIG. 9.0903

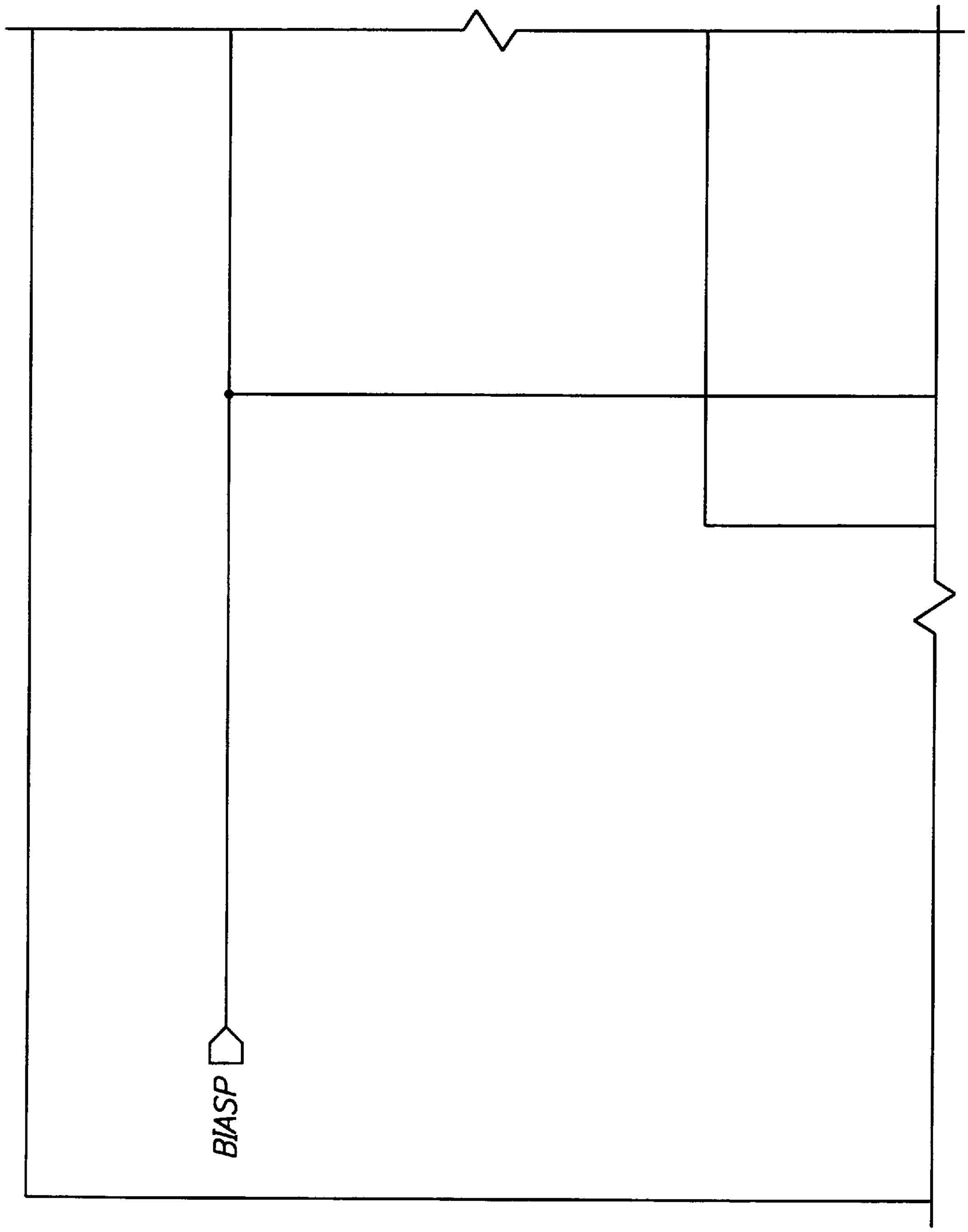
FIG. 9.0903AA

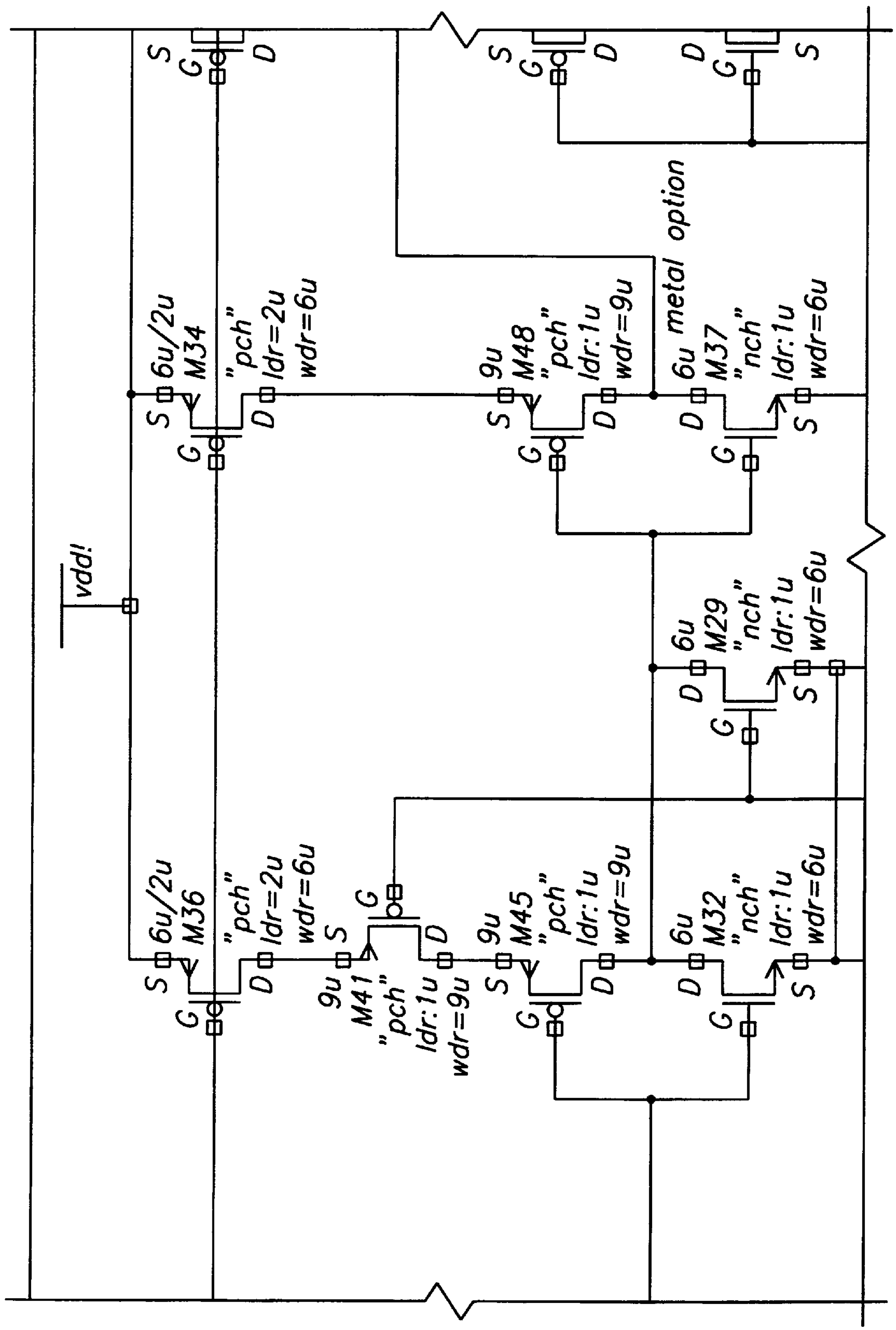
FIG. 9.090AB

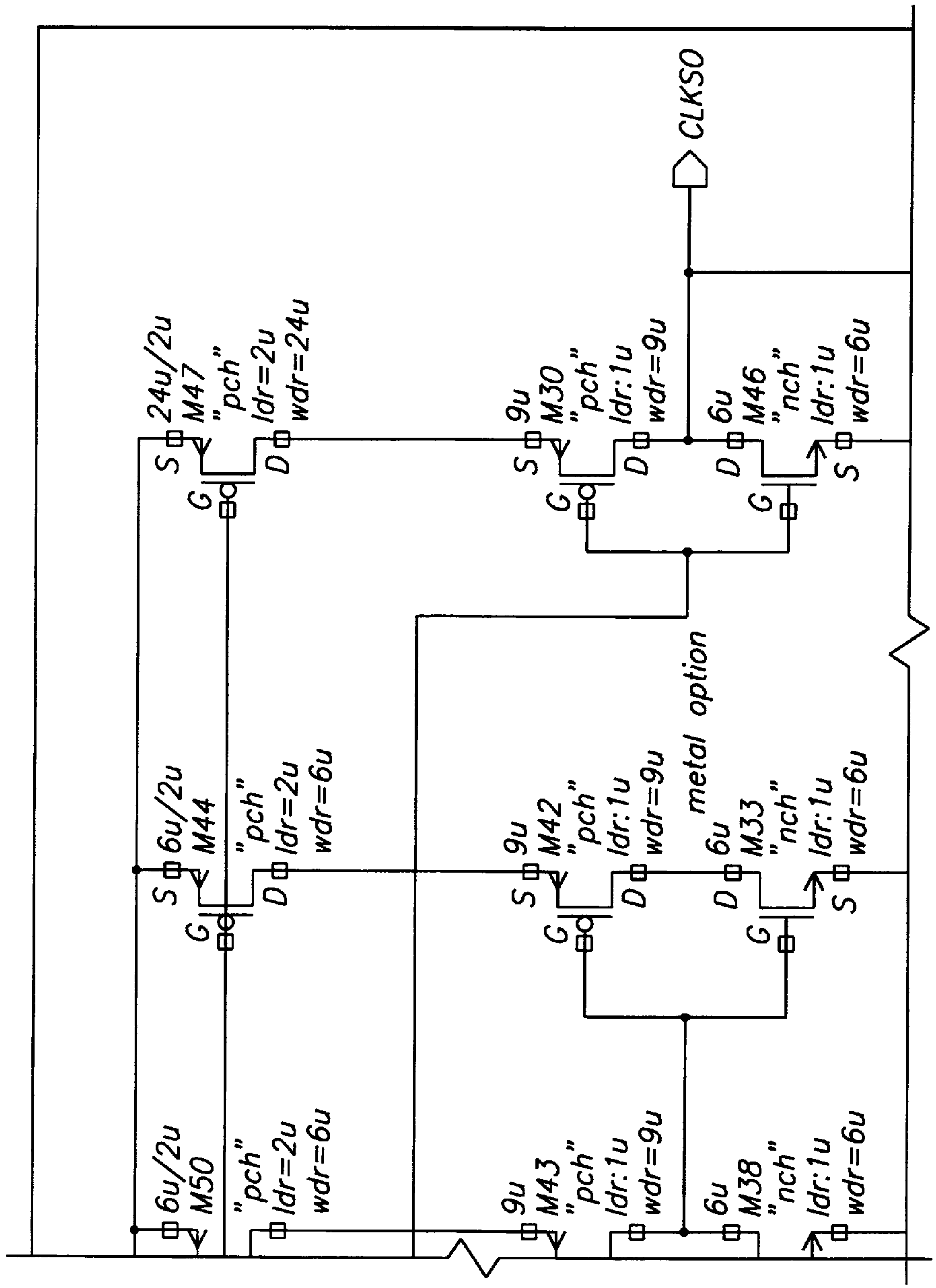
FIG 9.0903AC

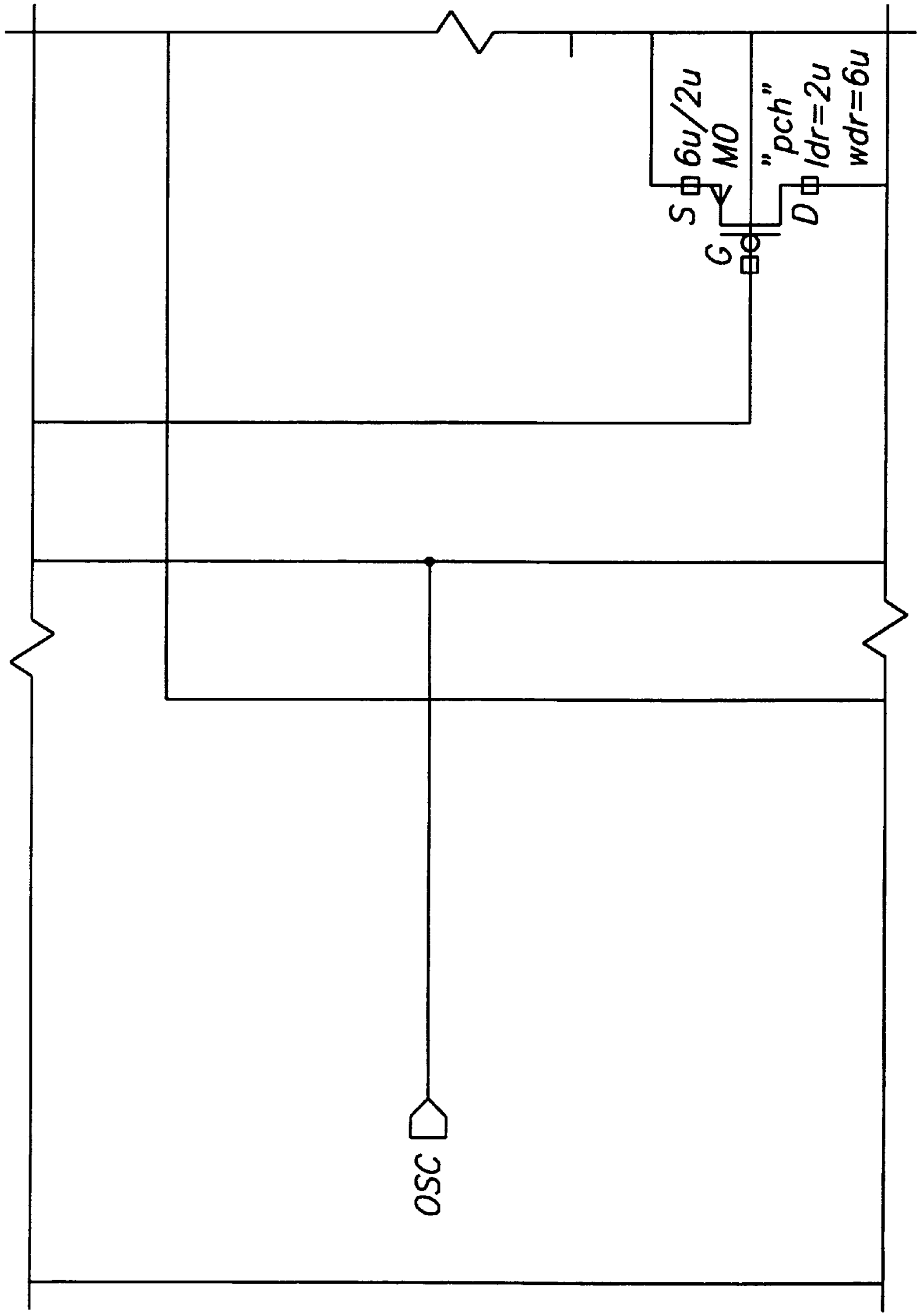
FIG. 9.0960.3BA

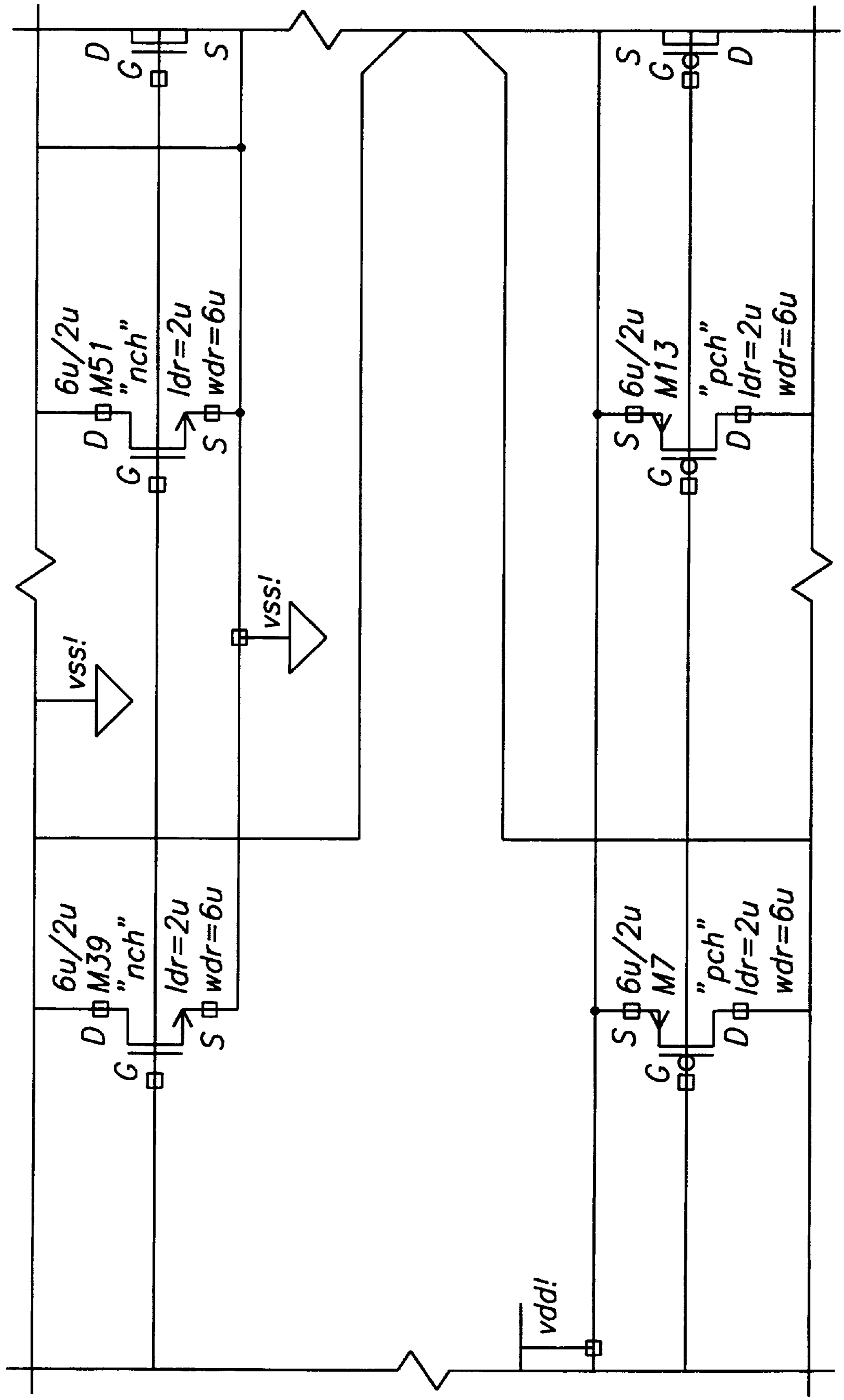
FIG. 9.0906BB

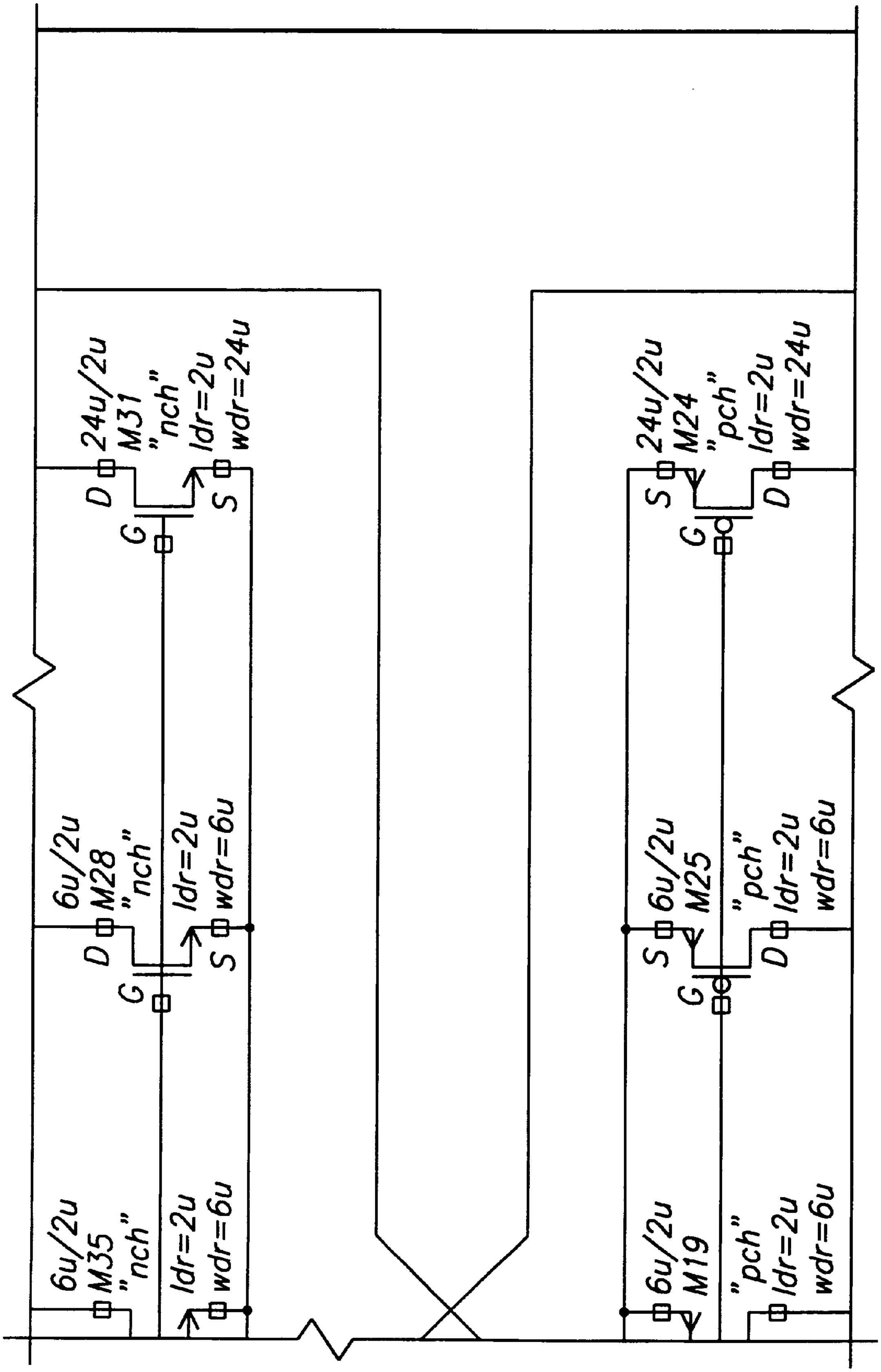
FIG. 9.090BC

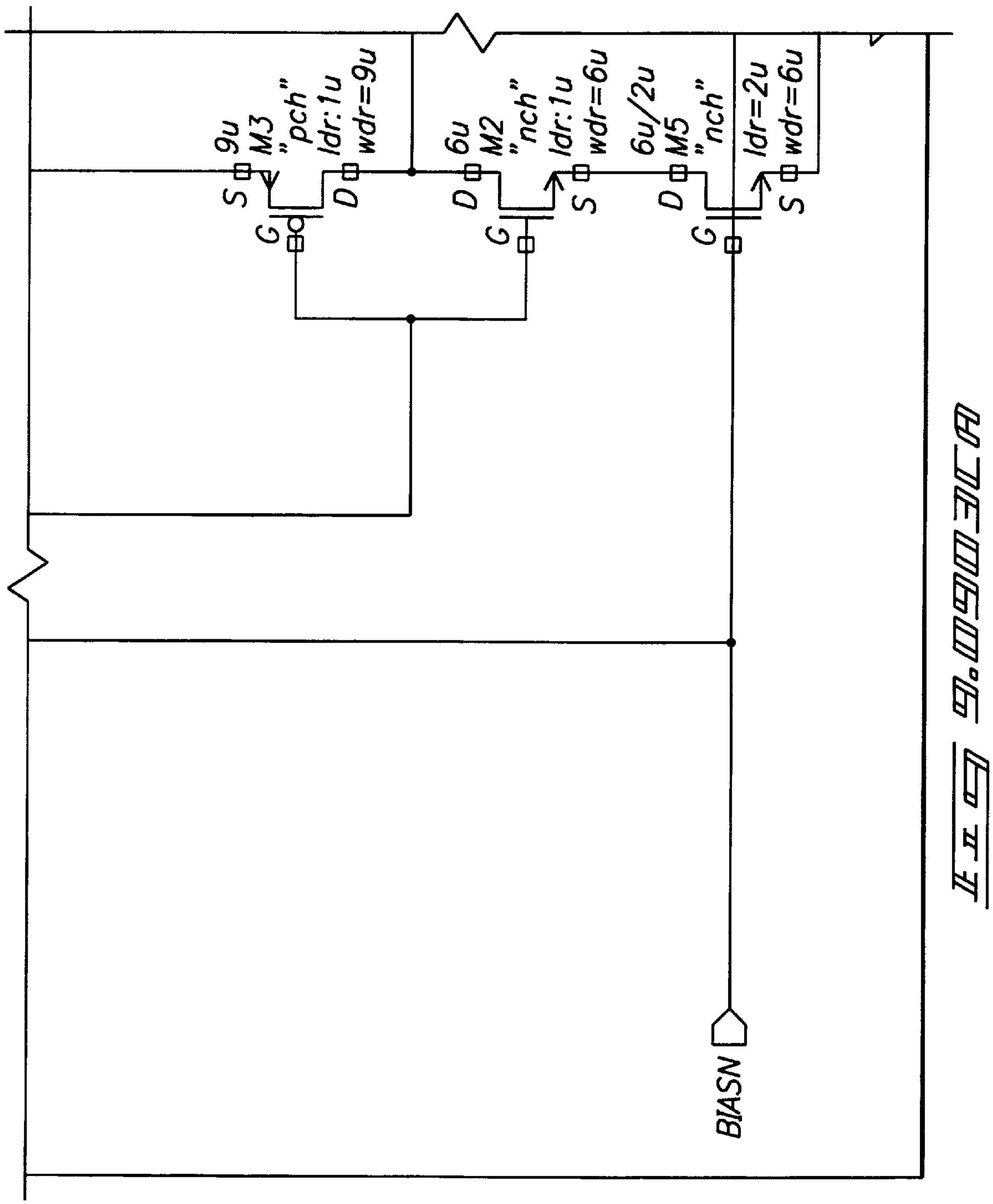
Fig. 9.0603CA

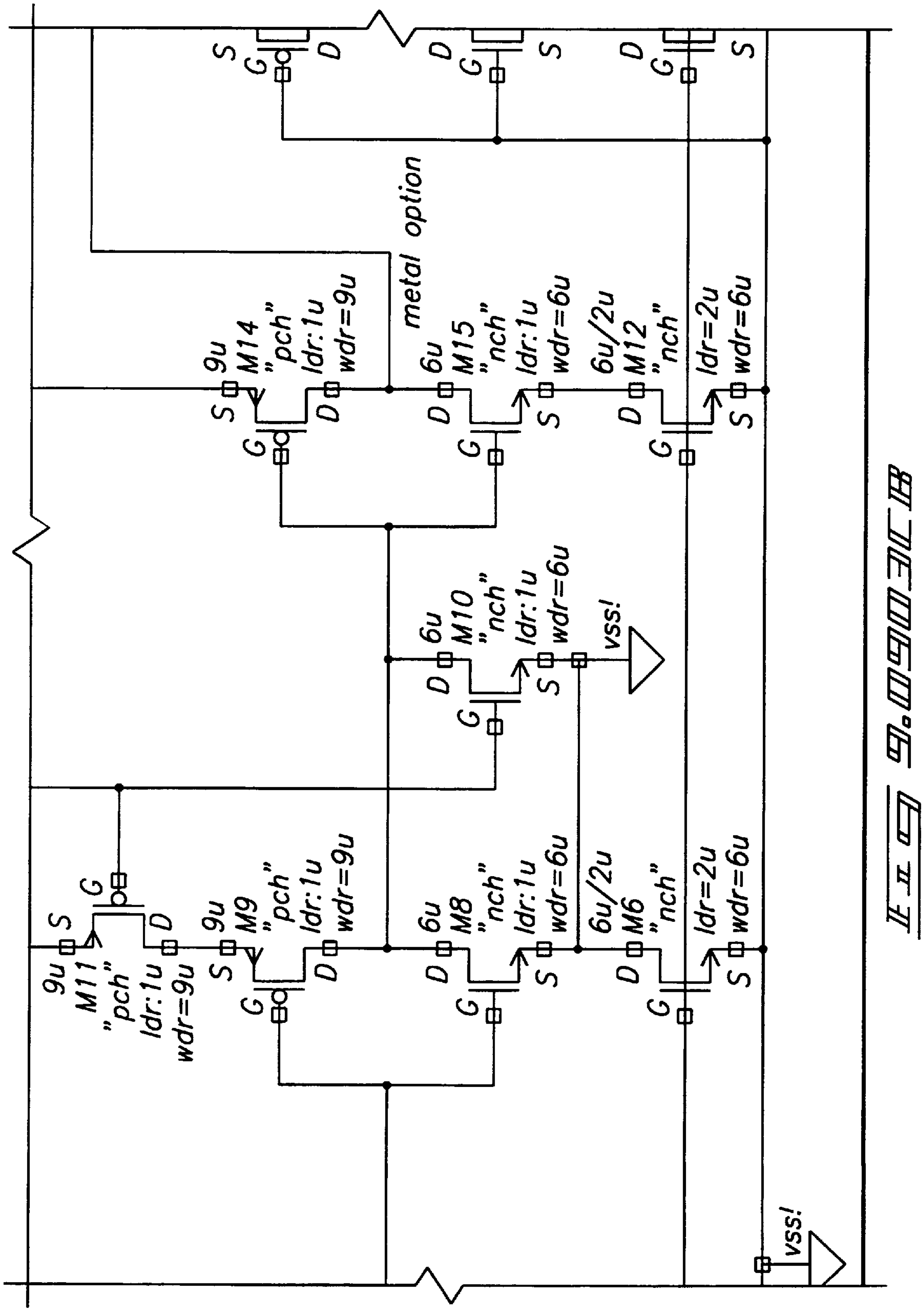
FIG. 9.090CB

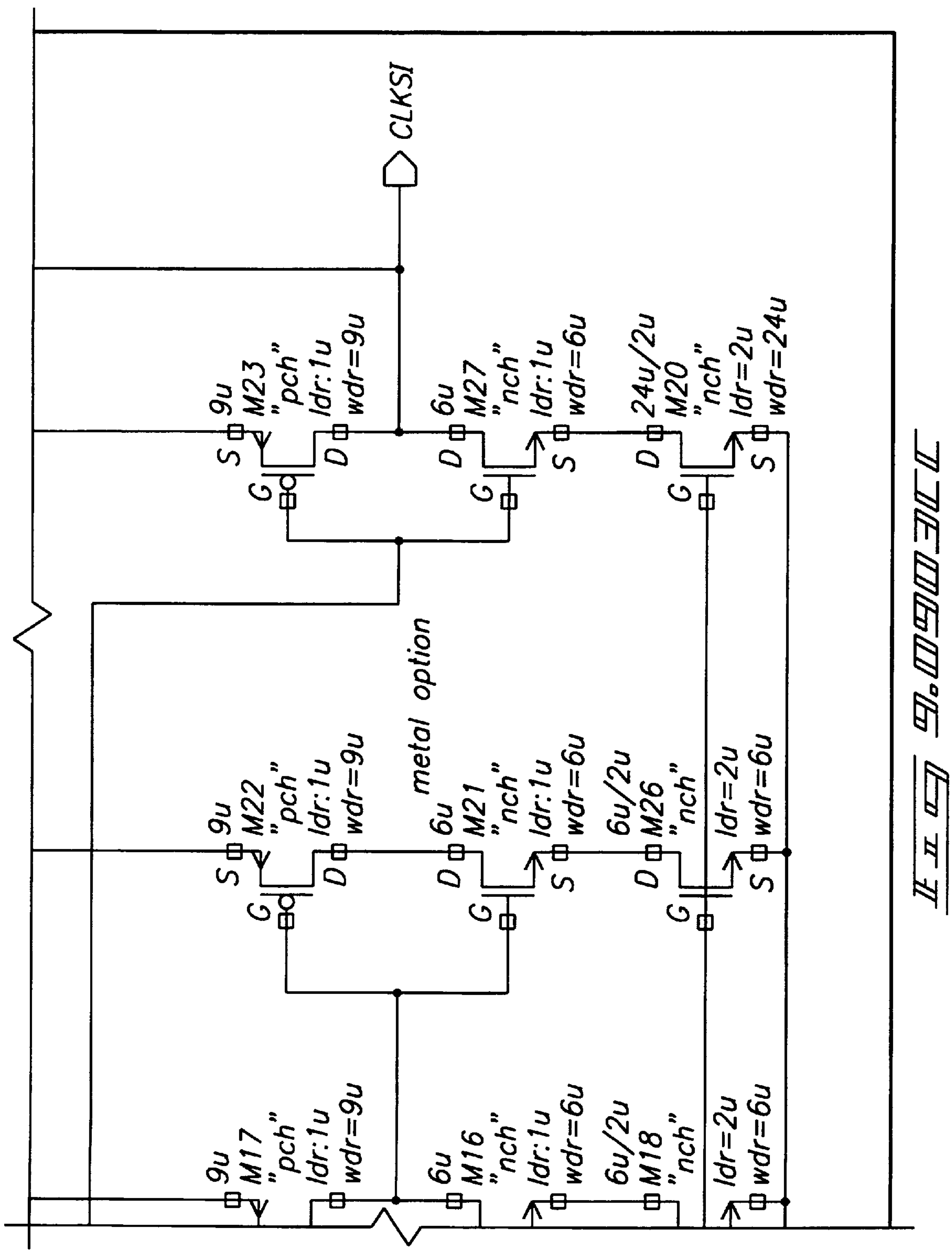
CLKSI
9u M23 "pch" ldr:1u wdr=9u
6u M27 "nch" ldr:1u wdr=6u
24u/2u M20 "nch" ldr=2u wdr=24u
9u M22 "pch" ldr:1u wdr=9u
6u M21 "nch" ldr:1u wdr=6u
6u/2u M26 "nch" ldr=2u wdr=6u
9u M17 "pch" ldr:1u wdr=9u
6u M16 "nch" ldr:1u wdr=6u
6u/2u M18 "nch" ldr=2u wdr=6u
metal option

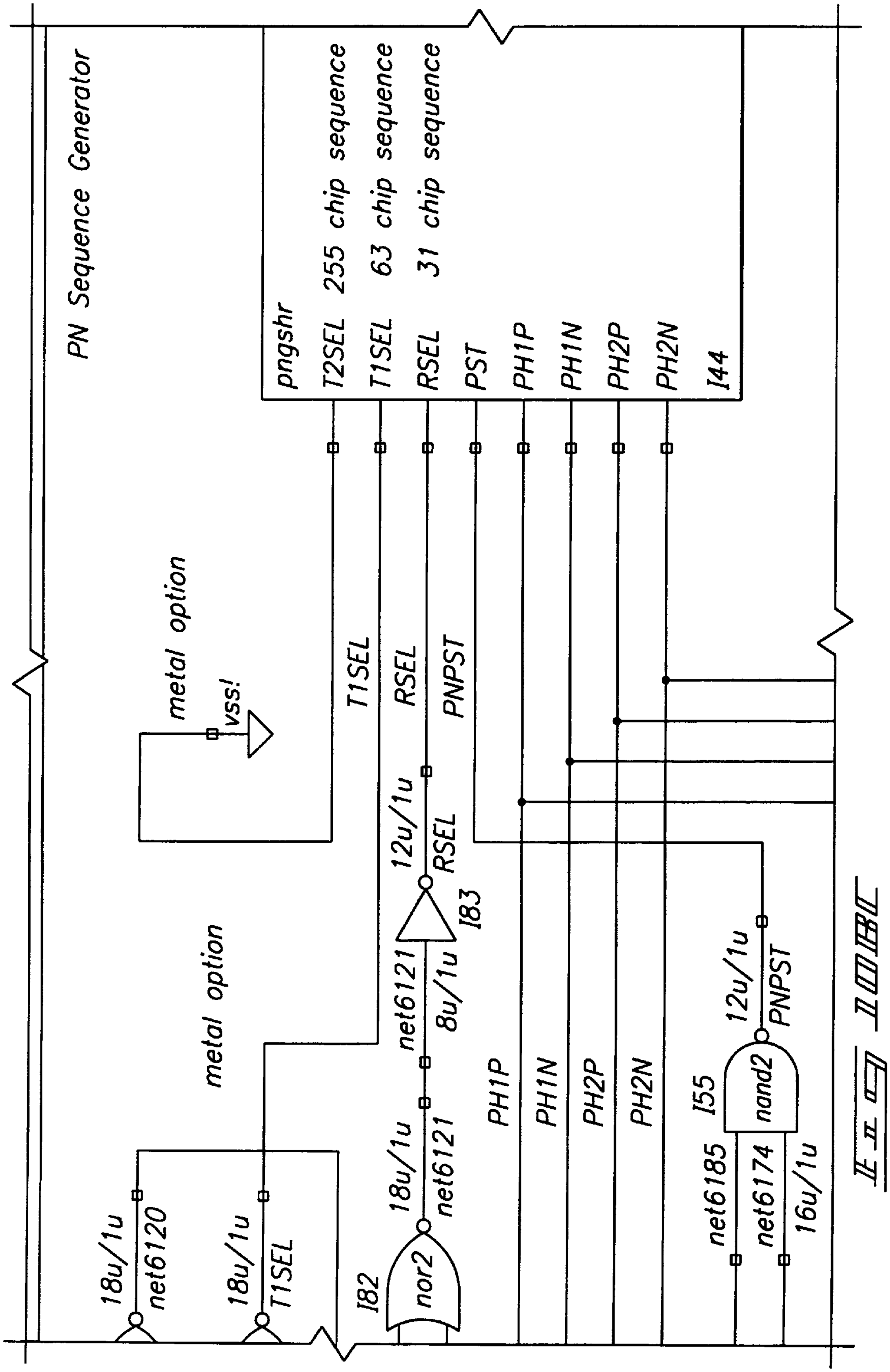
FIG_100BC

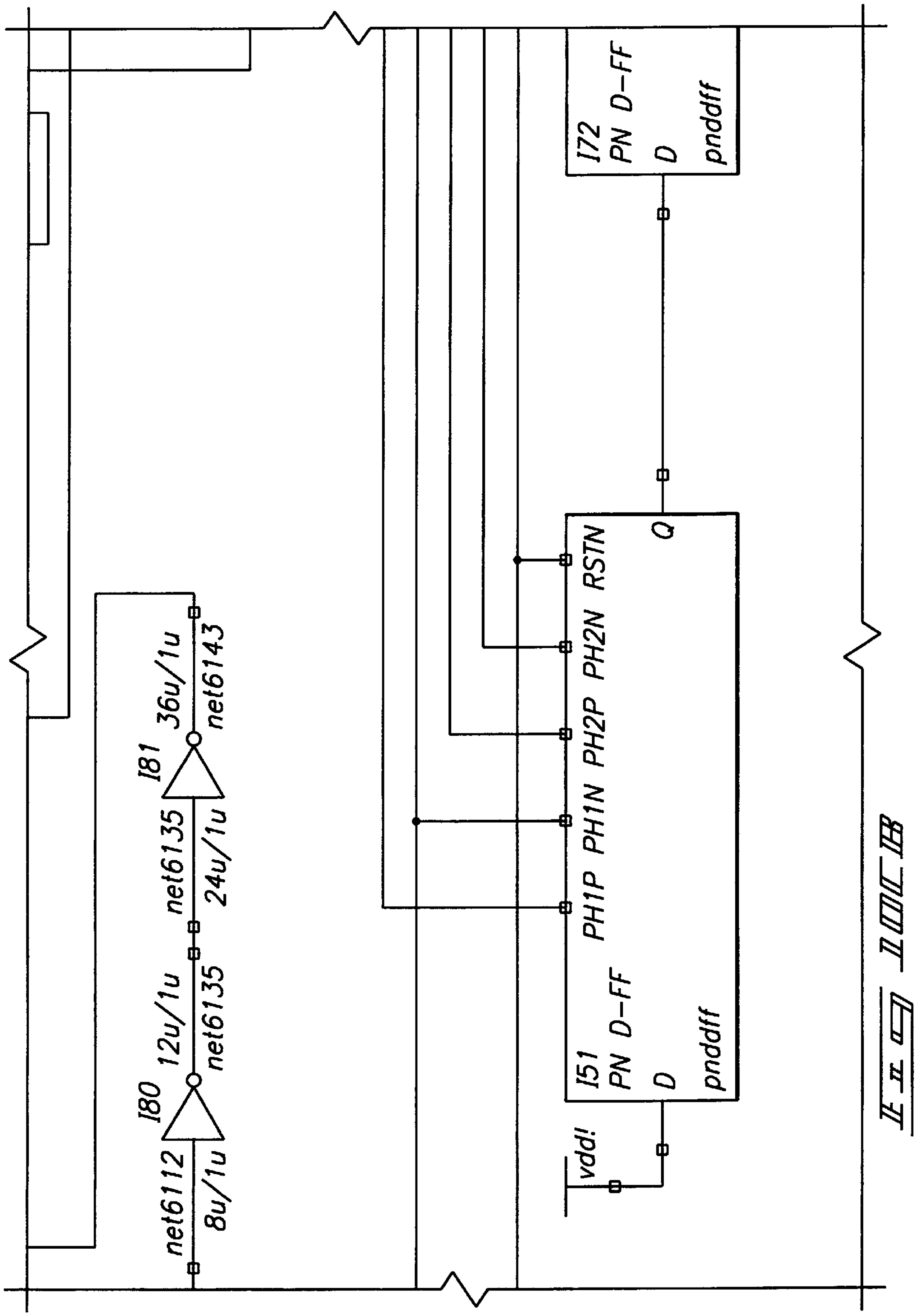
I72
PN D-FF
D
pnddff
Q
RSTN
PH2N
PH2P
PH1N
PH1P
I51
PN D-FF
D
pnddff
vdd!
I81
36u/1u
net6143
net6135
24u/1u
I80
12u/1u
net6135
net6112
8u/1u

| | | | | | | | | | |
|---|---|---|---|---|---|---|---|---|---|
| 10.01AA | 10.01AB | 10.01AC | 10.01AD | 10.01AE | 10.01AF | 10.01AG | | | |
| 10.01BA | 10.01BB | 10.01BC | 10.01BD | 10.01BE | 10.01BF | 10.01BG | 10.01BH | 10.01BI | 10.01BJ |
| 10.01CA | 10.01CB | 10.01CC | 10.01CD | 10.01CE | 10.01CF | 10.01CG | 10.01CH | 10.01CI | 10.01CJ |
| | 10.01DB | 10.01DC | 10.01DD | 10.01DE | 10.01DF | 10.01DG | 10.01DH | 10.01DI | 10.01DJ |

Fig 10.01I

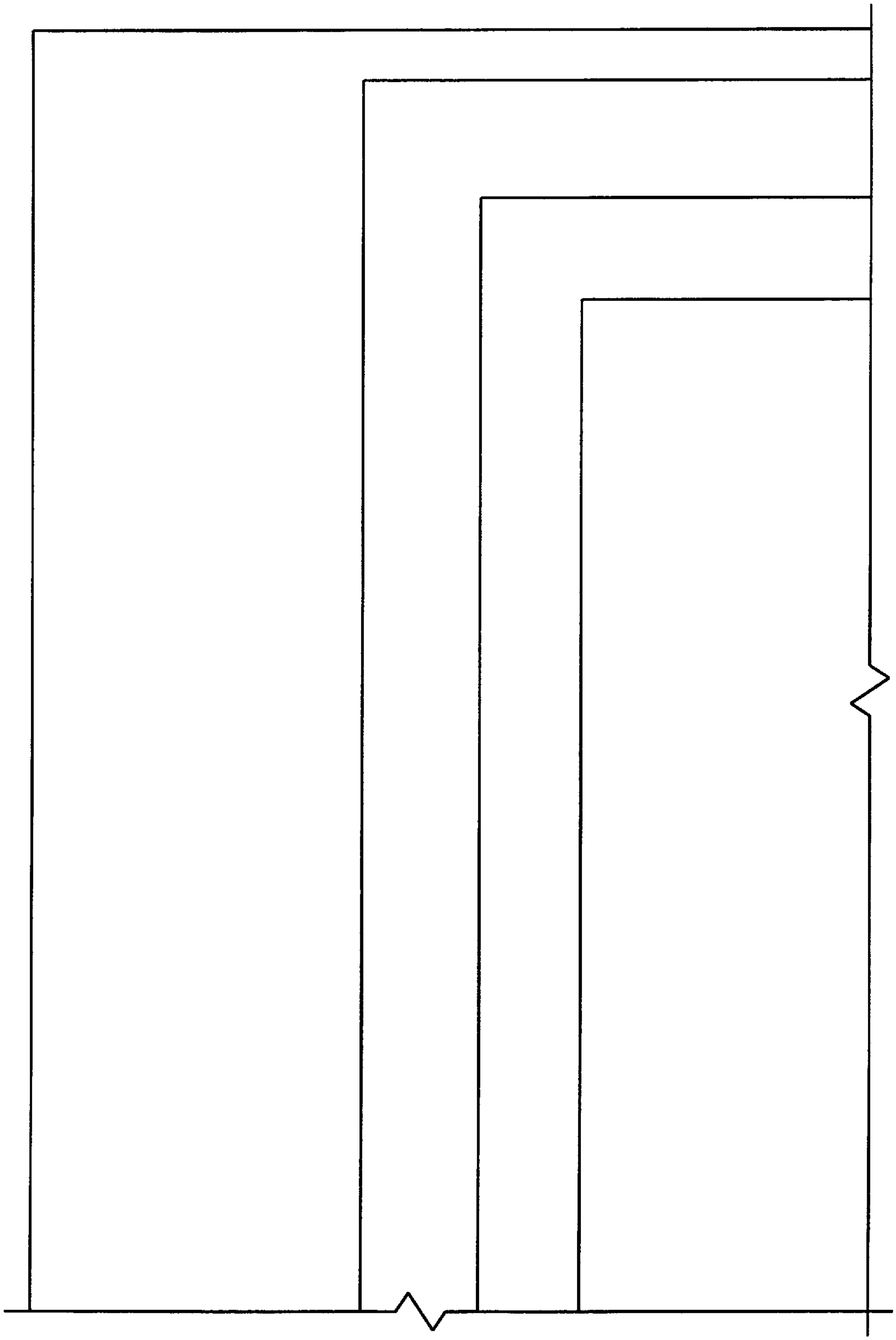
Fig 10.01AA

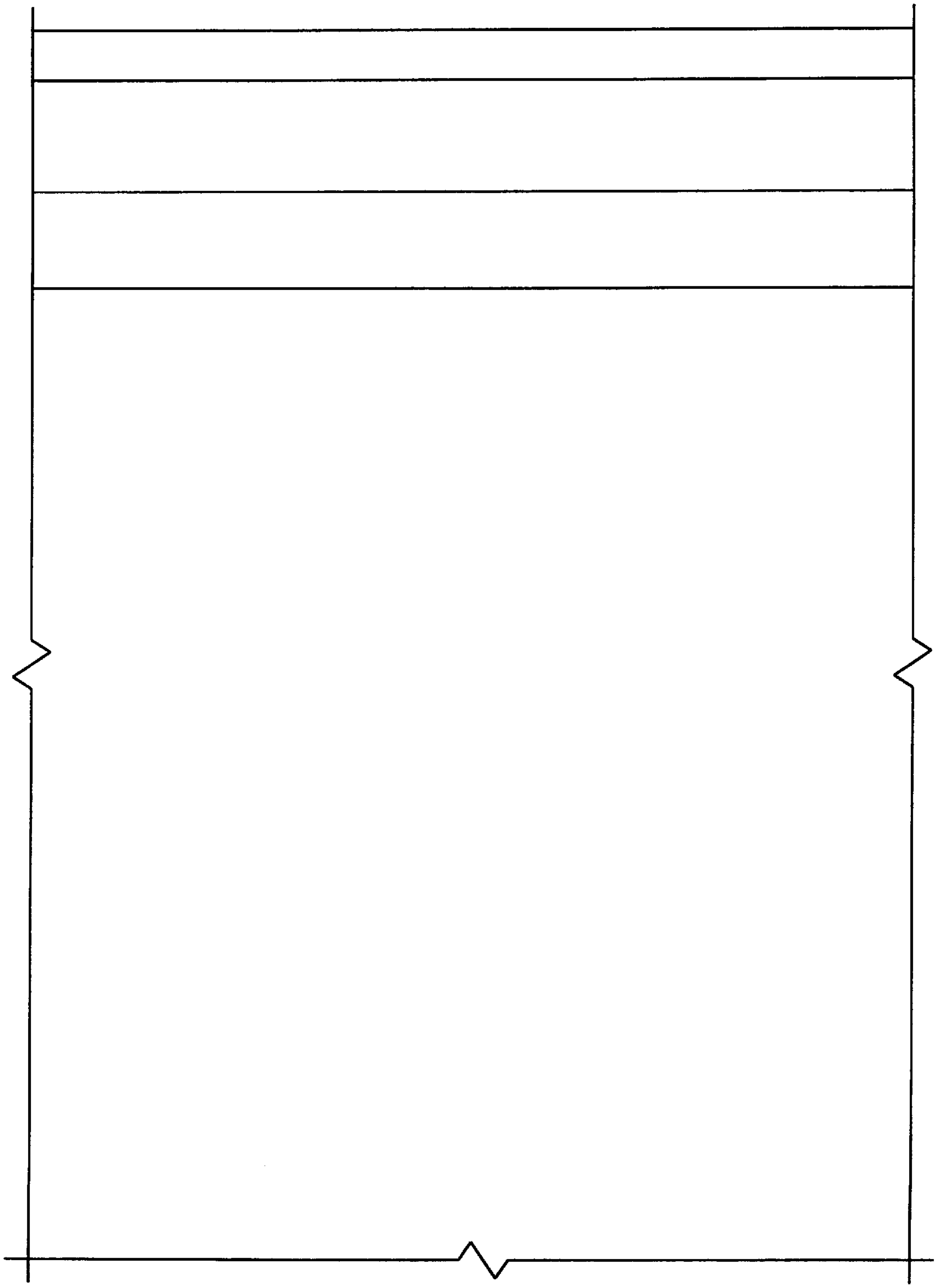
Fig 10.01AB

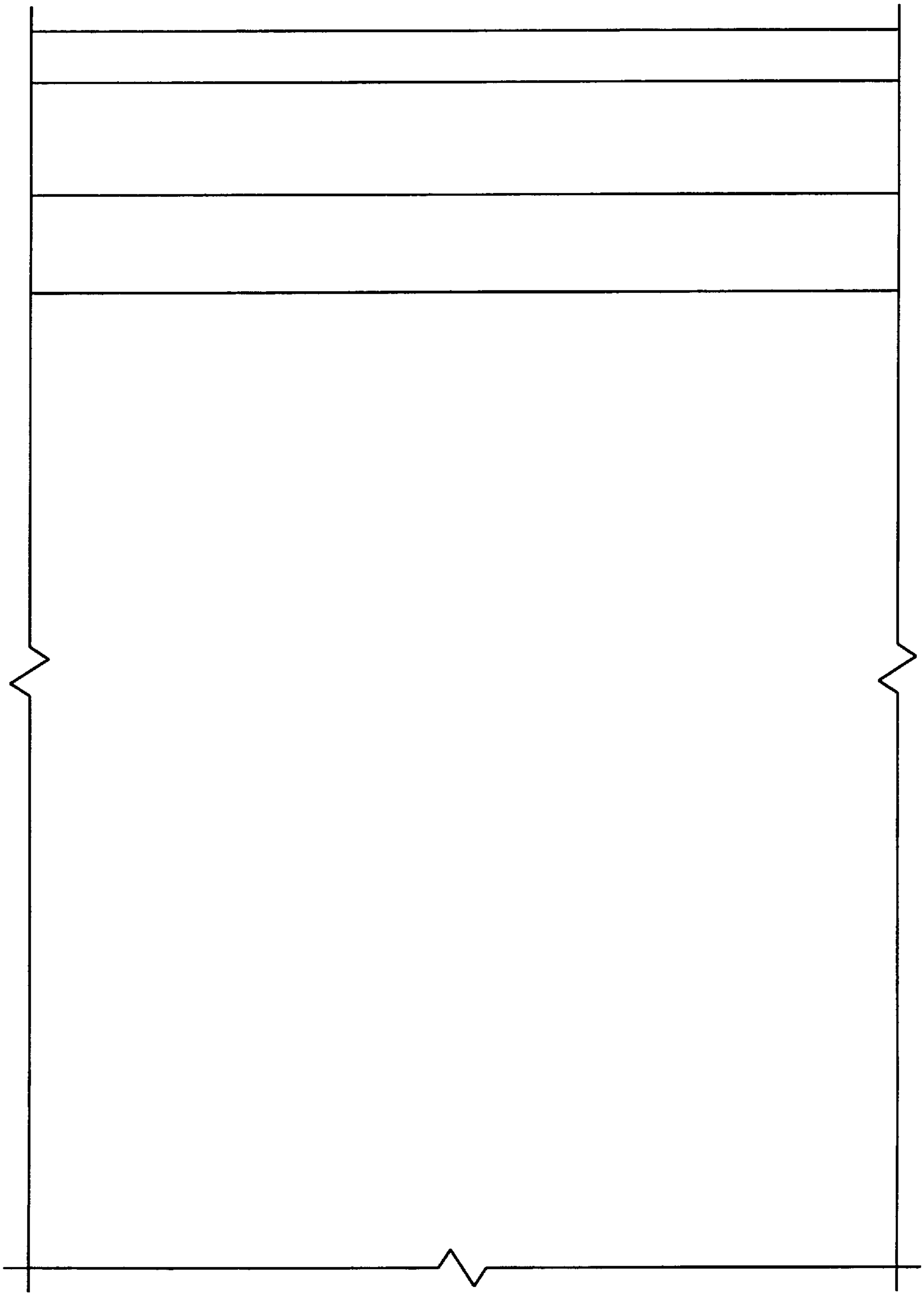
Fig 10.01AC

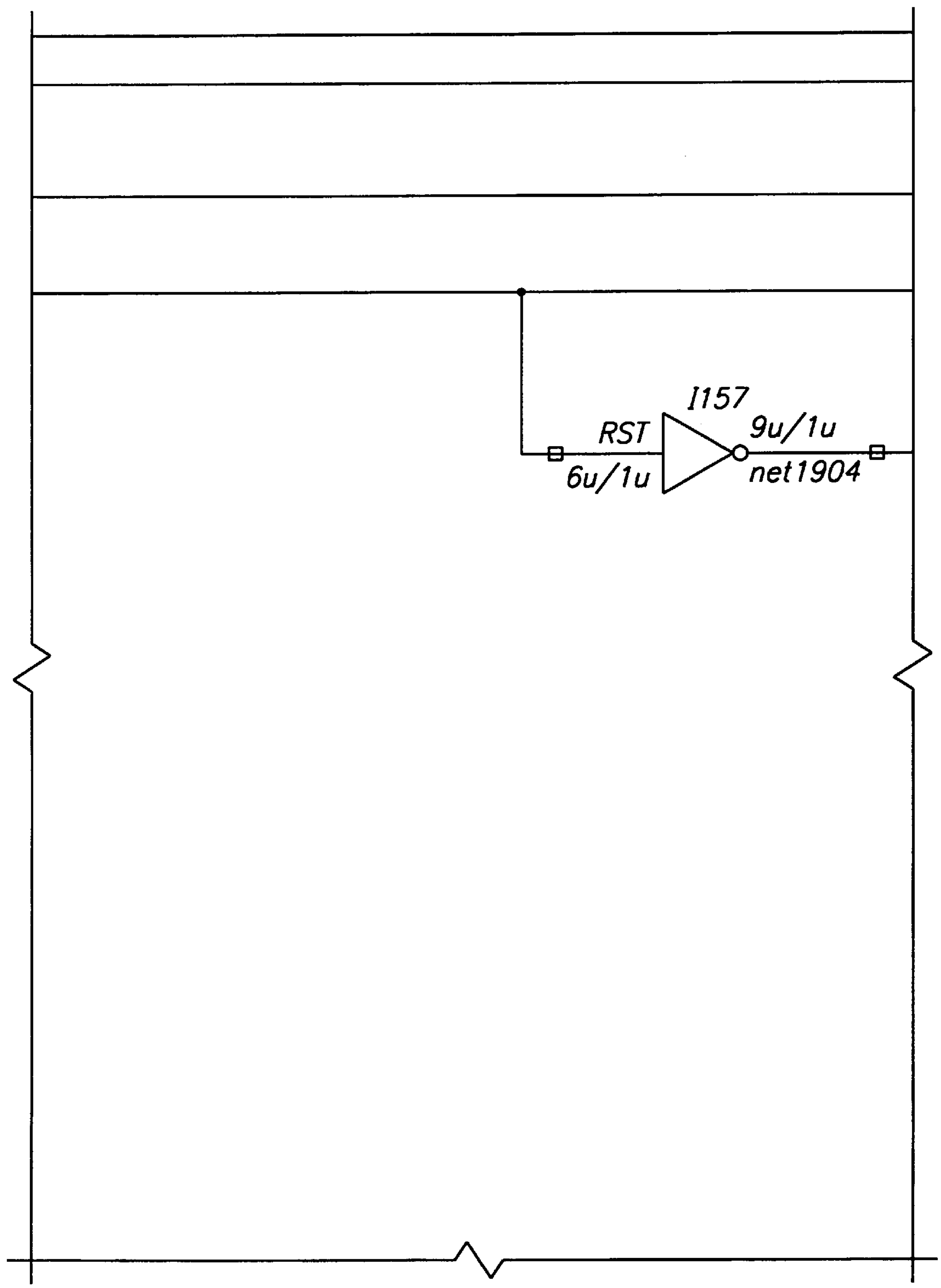
FIG 10.01AD

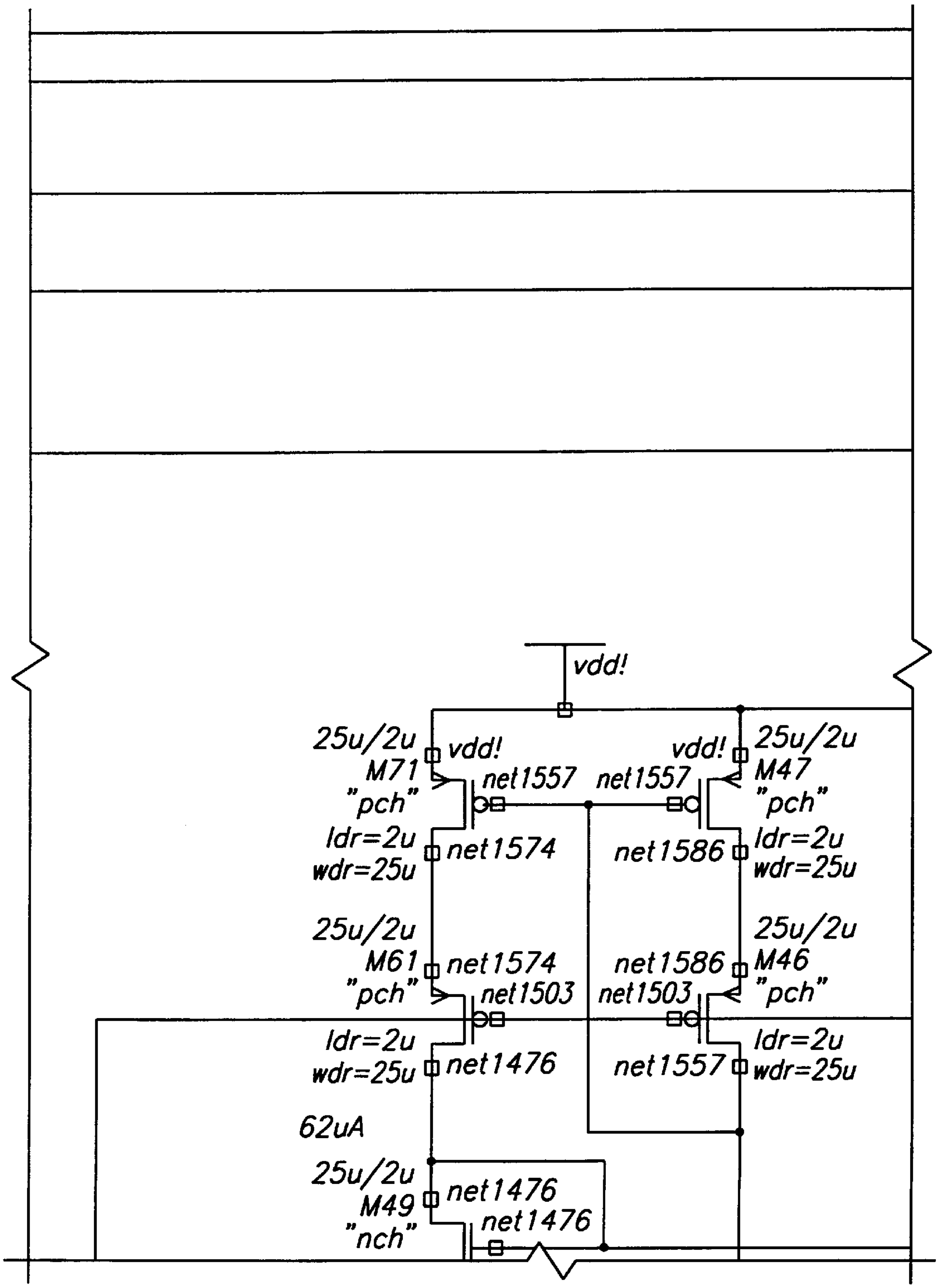
Fig 10.01AE

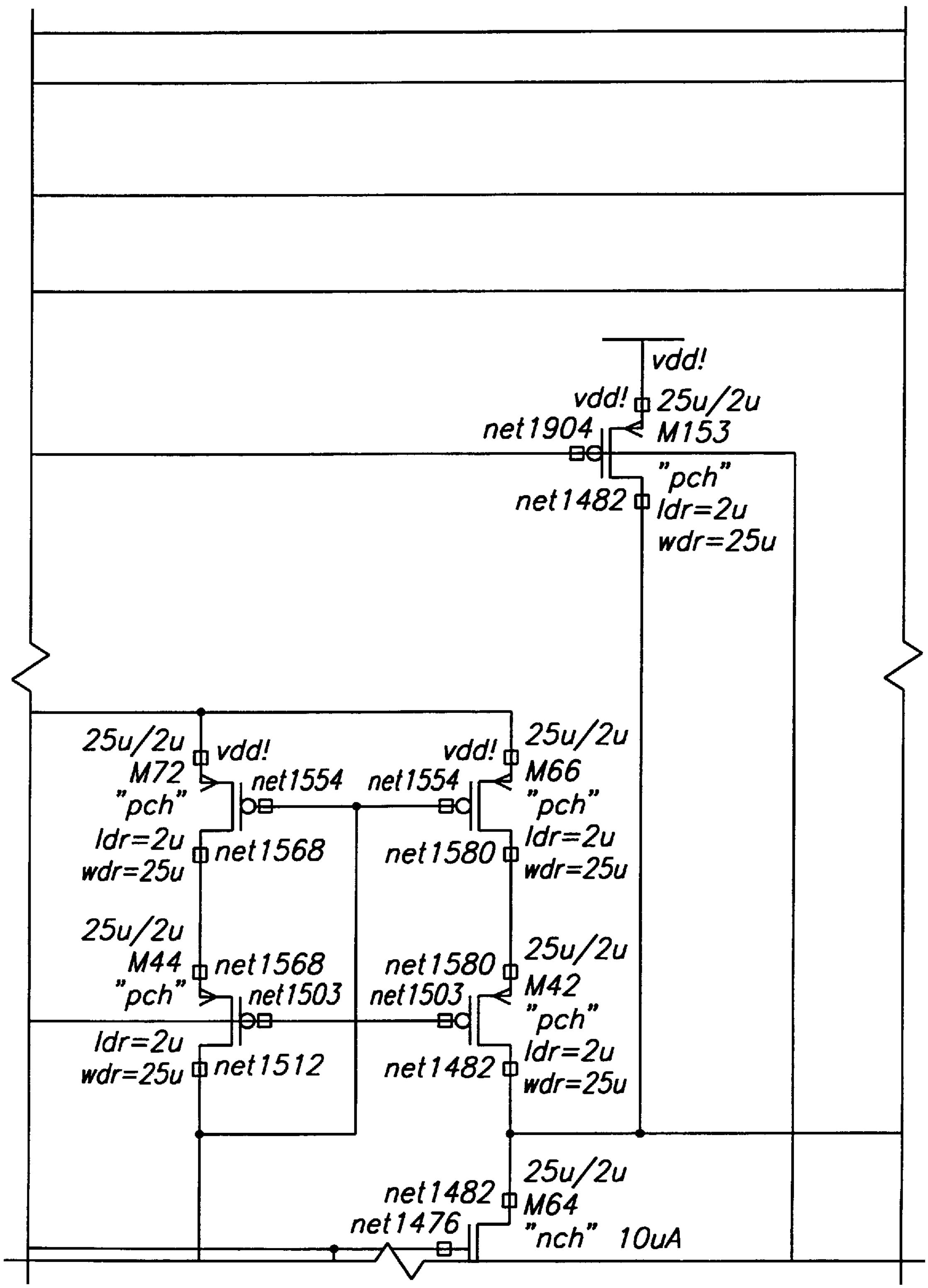
FIG. 10.01AF

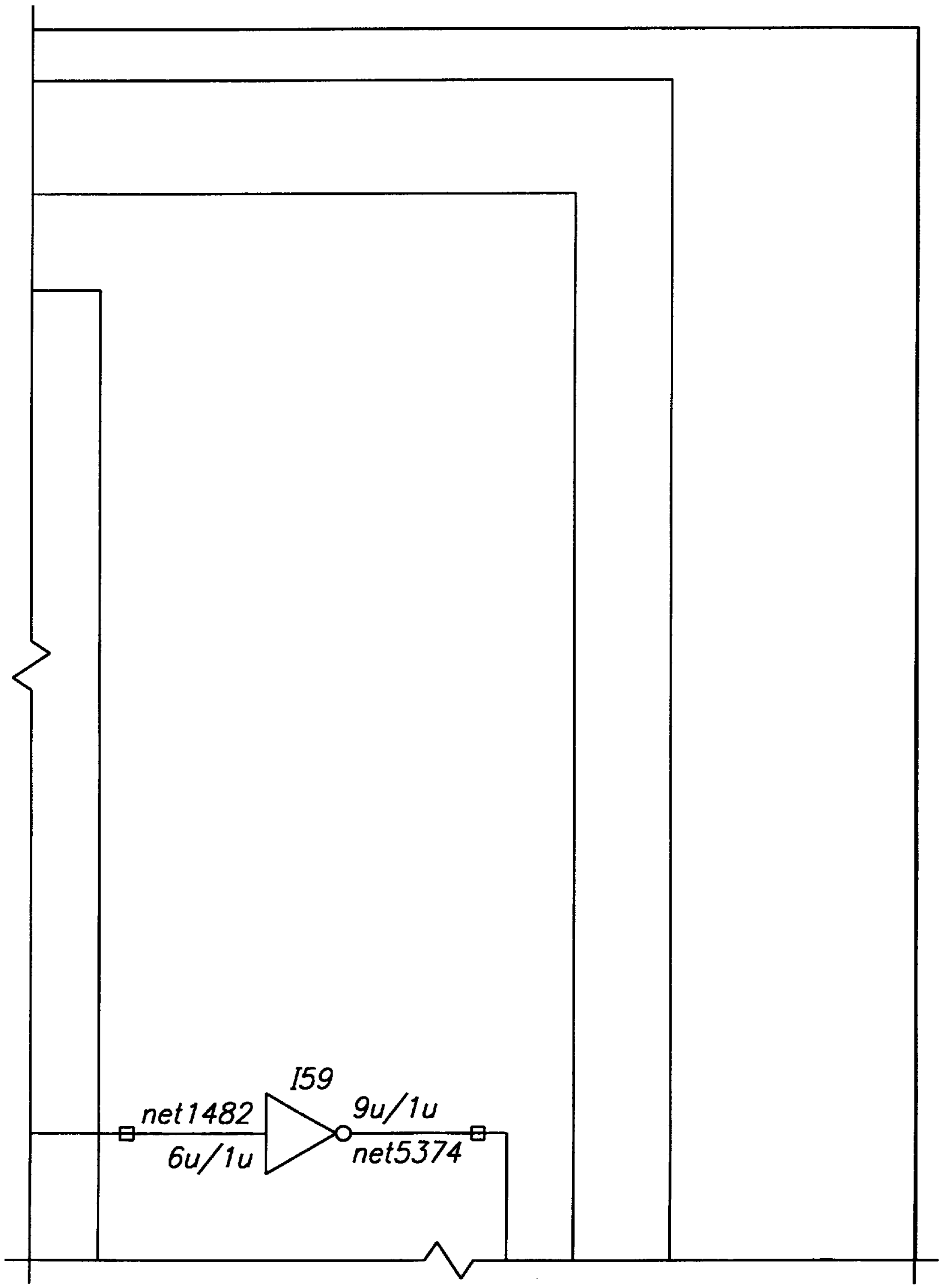
Fig. 10.01AG

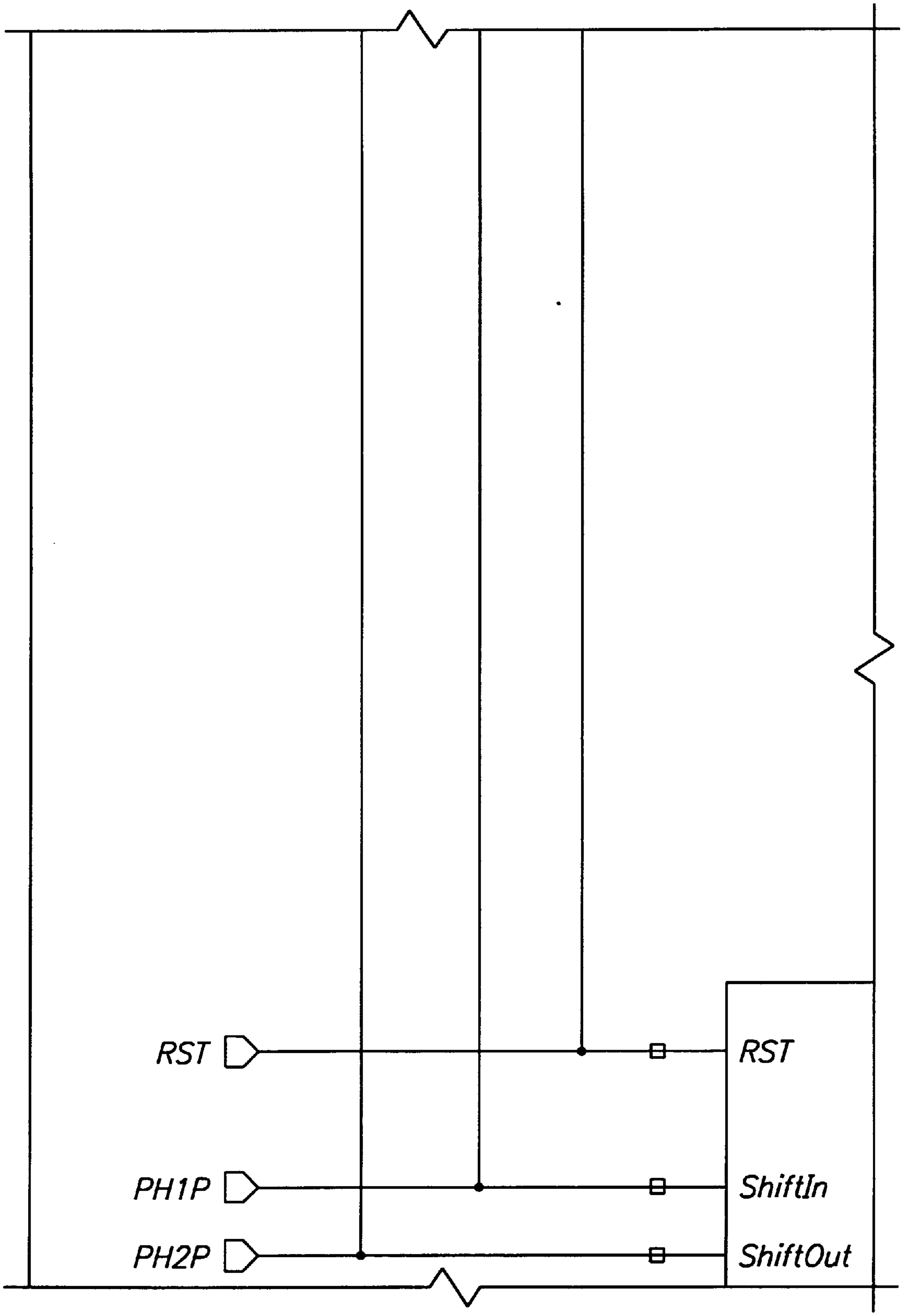
Fig 10.01BA

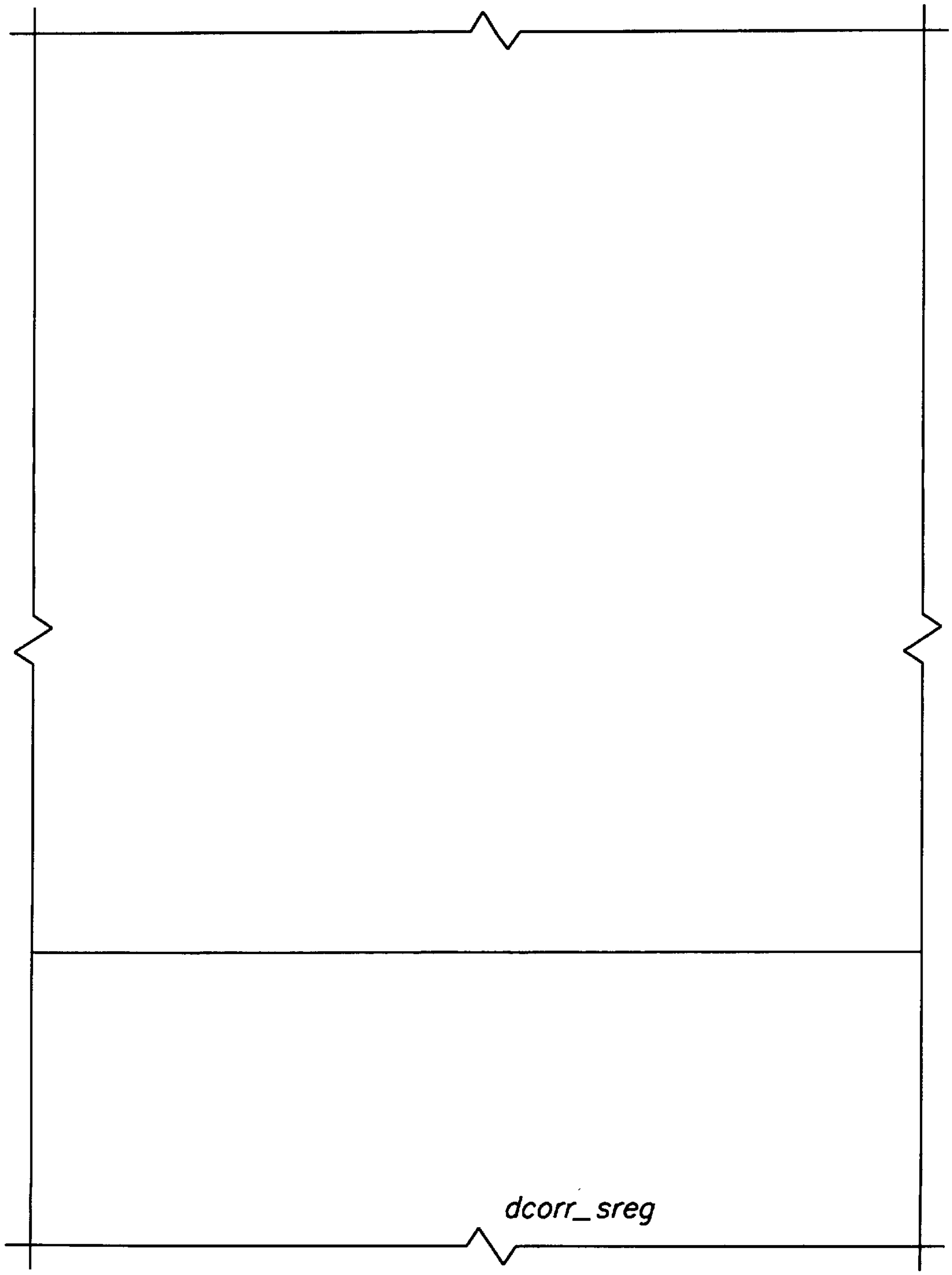
Fig 10.01BB

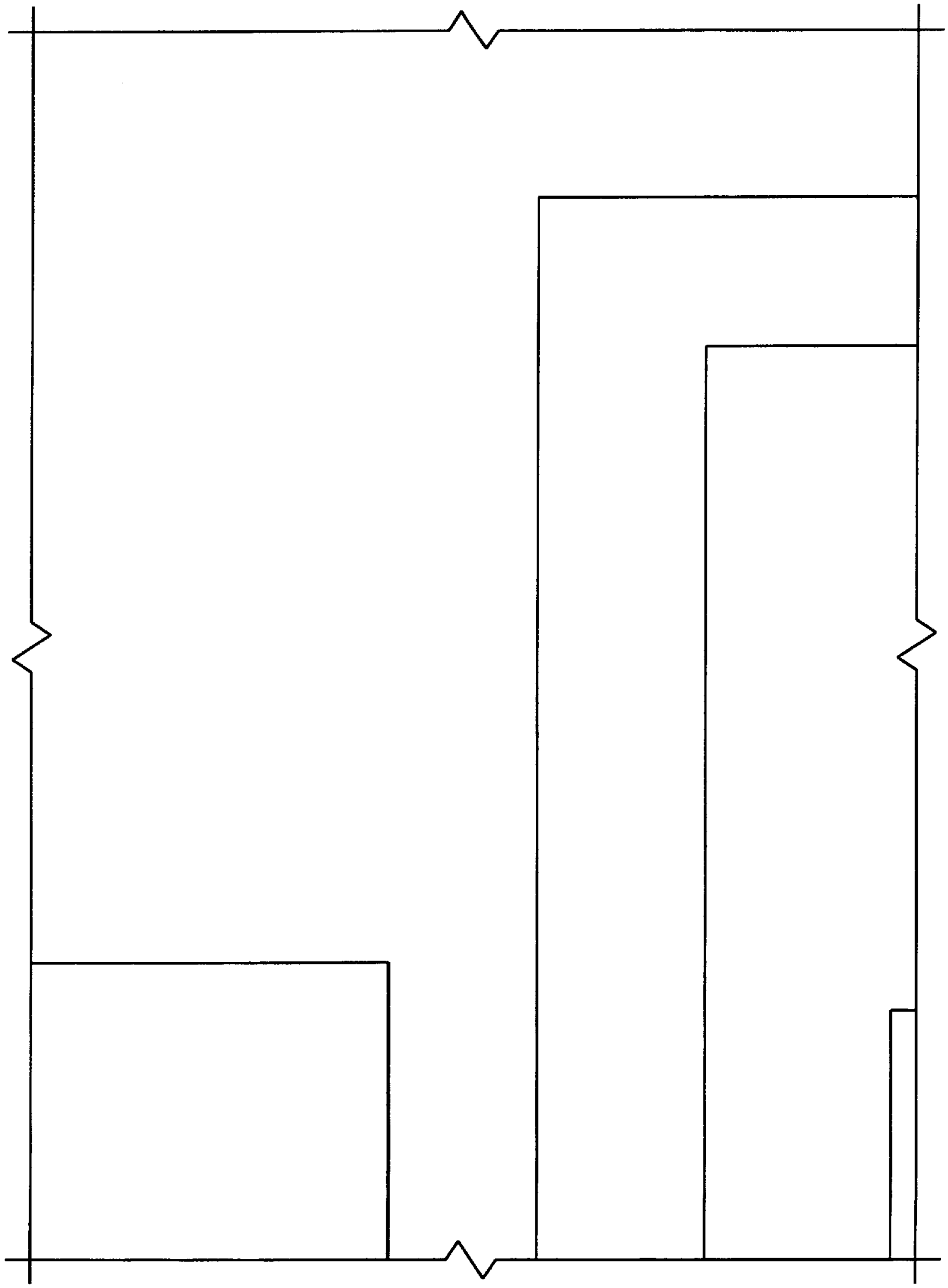
Fig 10.01BC

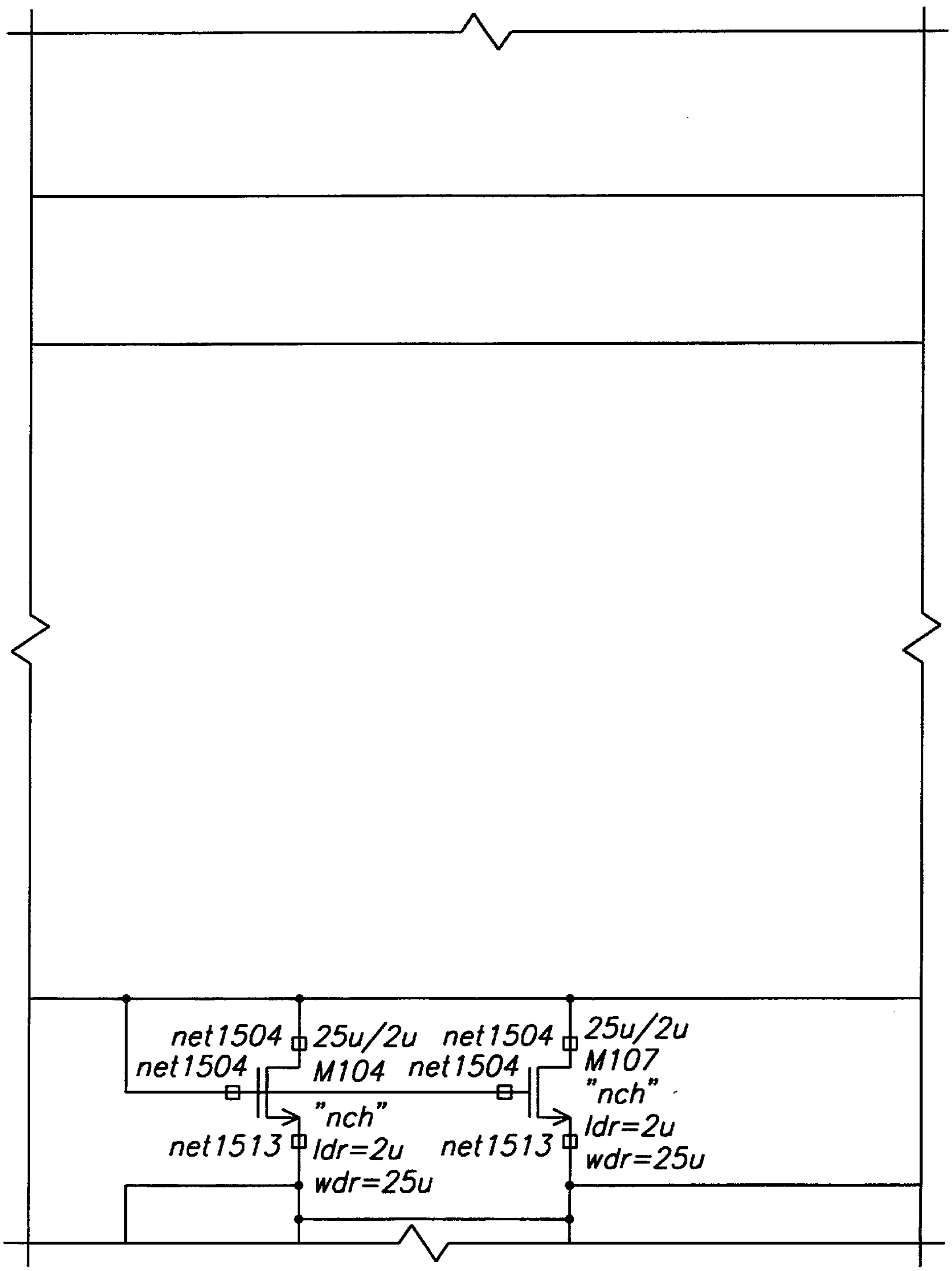
Fig 10.01BD

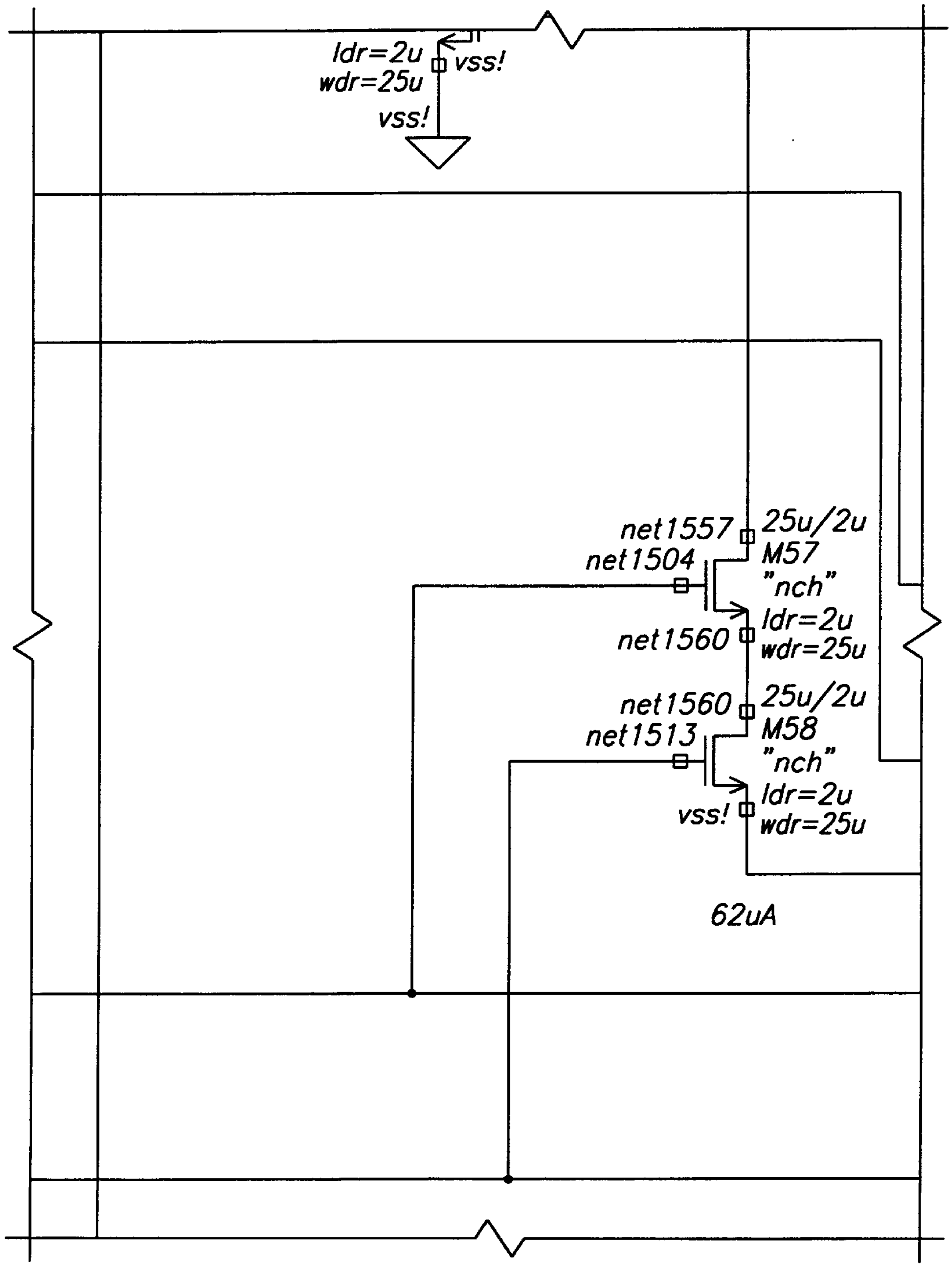
Fig 10.01BE

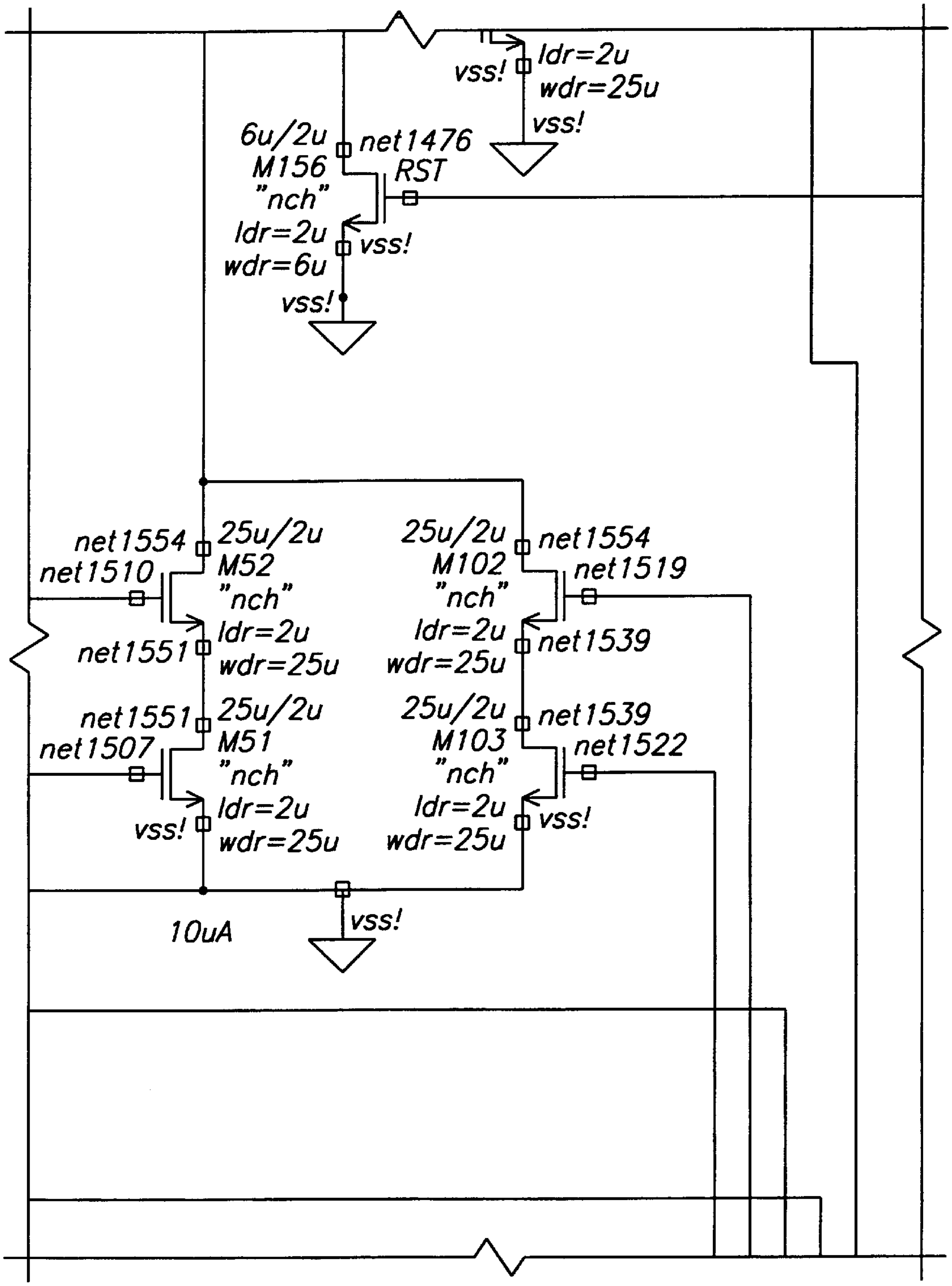
FIG. 10.01BF

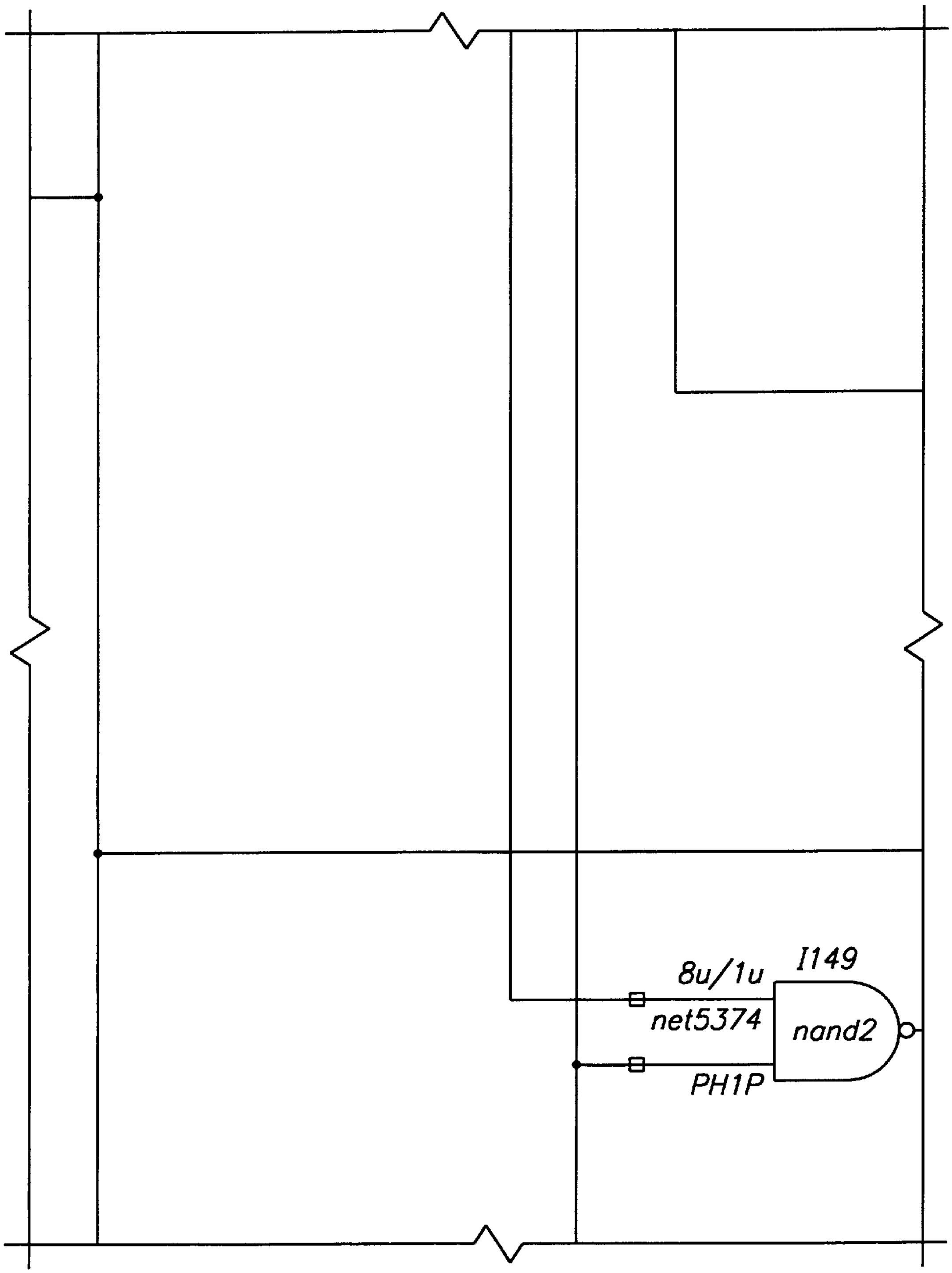
Fig 10.01BG

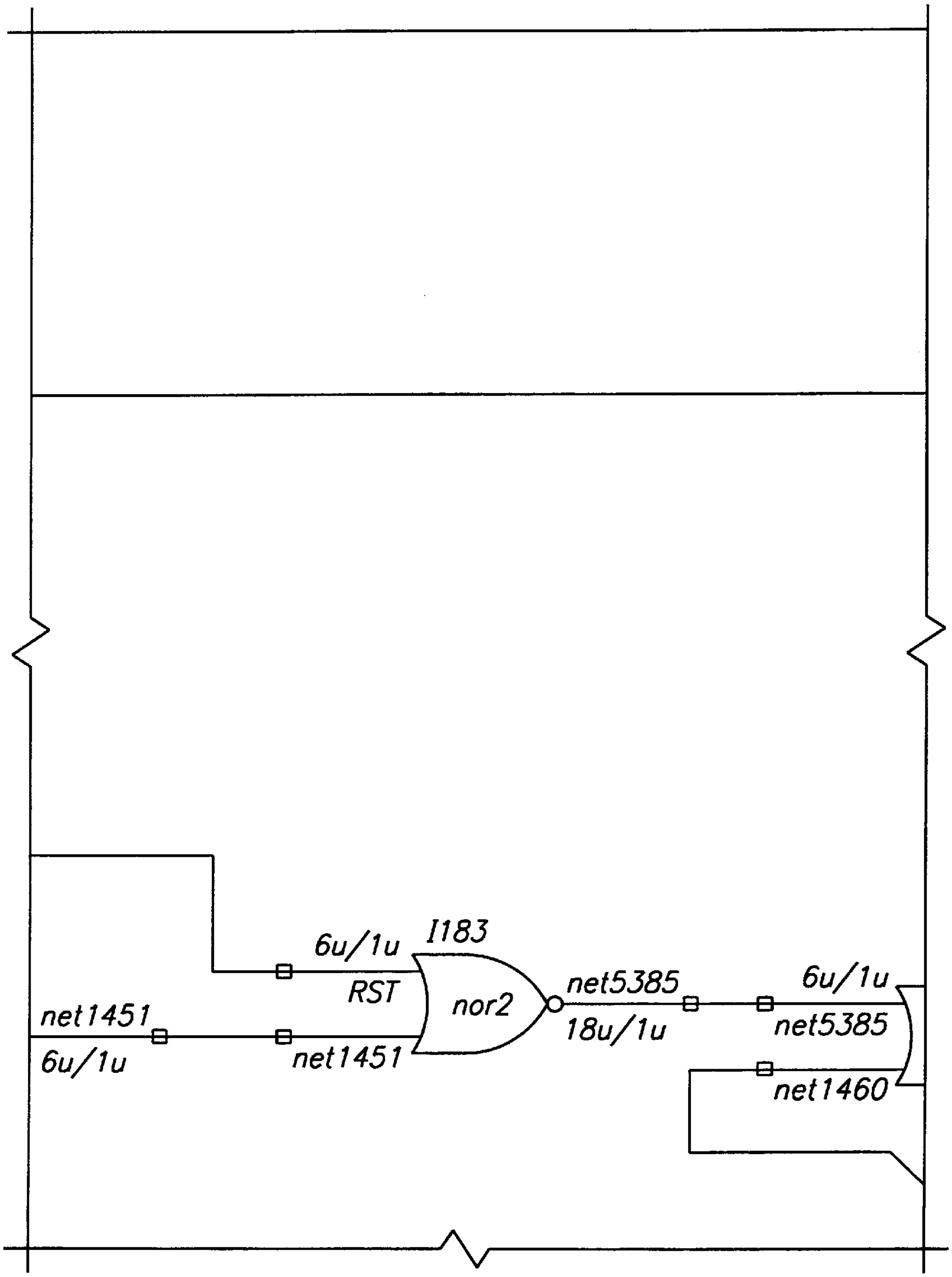
Fig 10.01BH

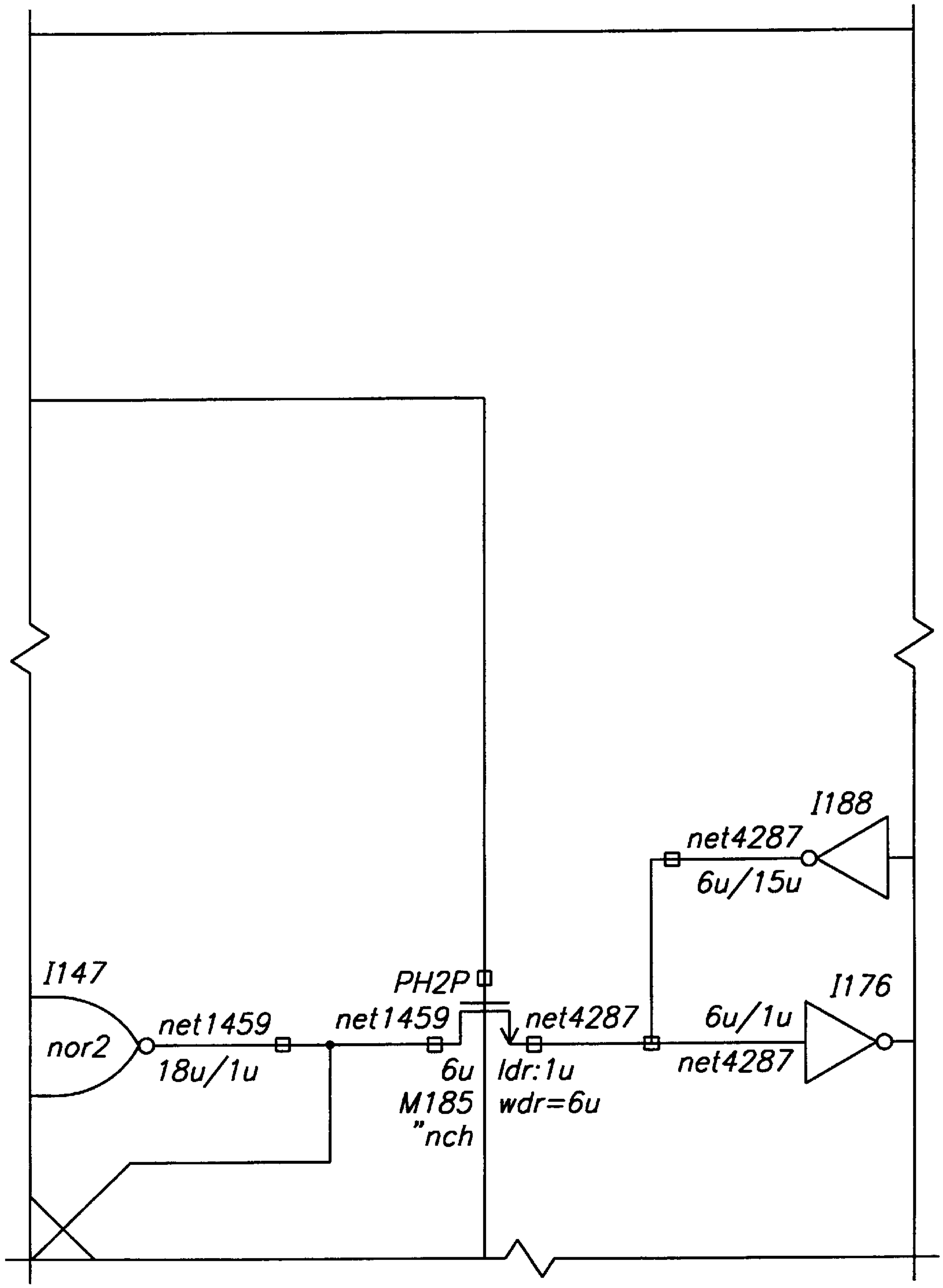
Fig 10.01BI

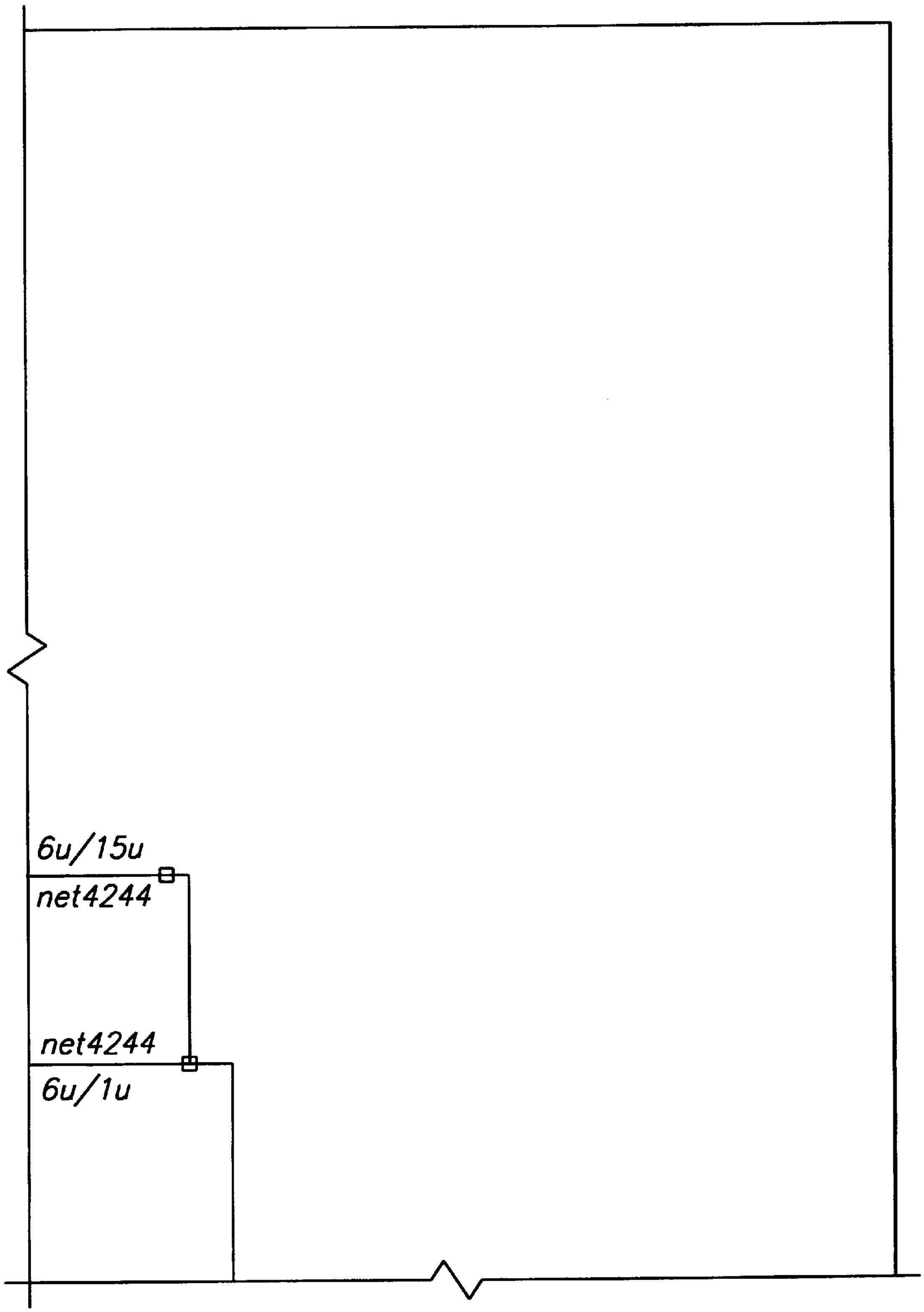
Fig 100.01B.1

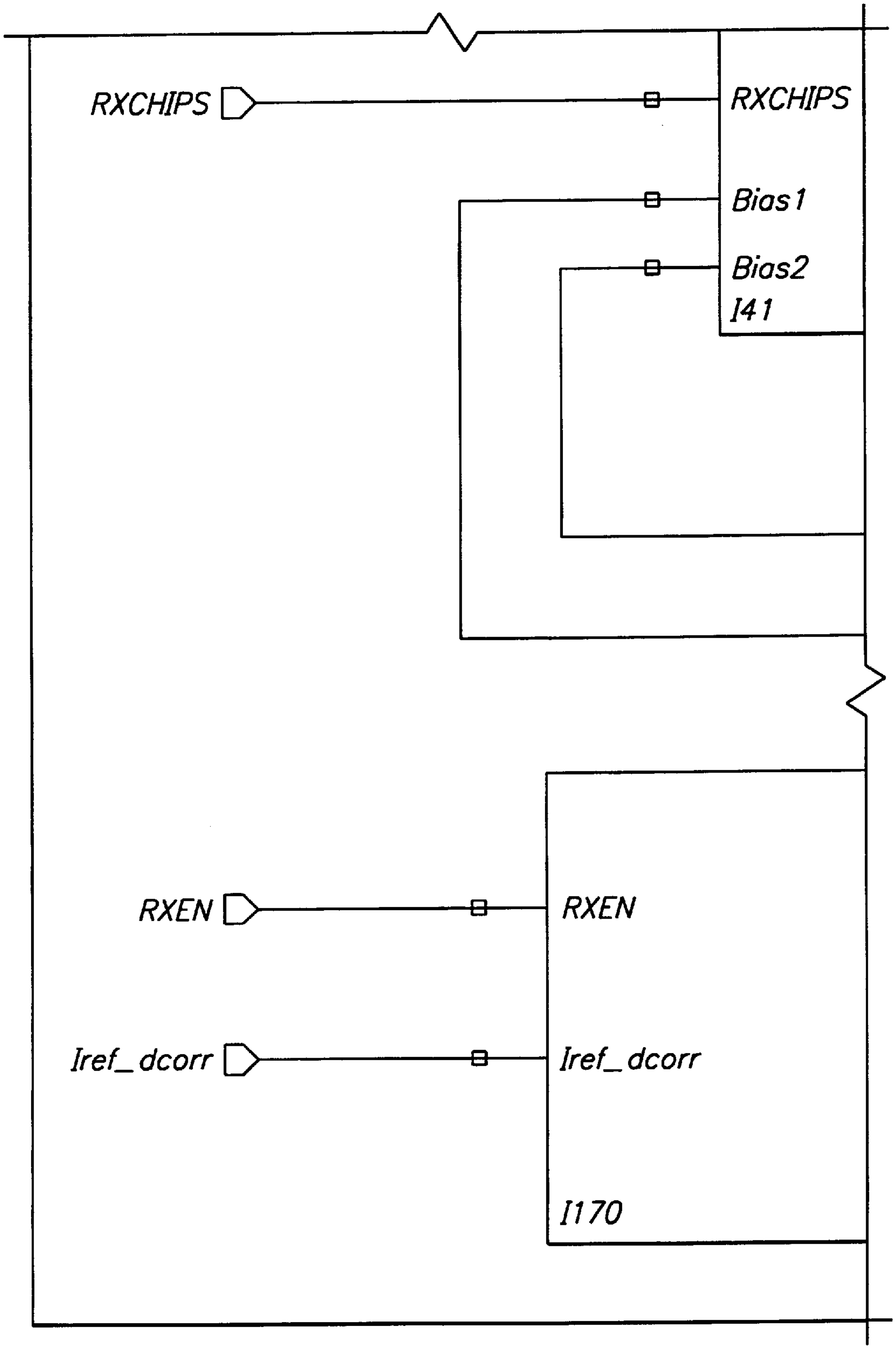
Fig 10.01CA

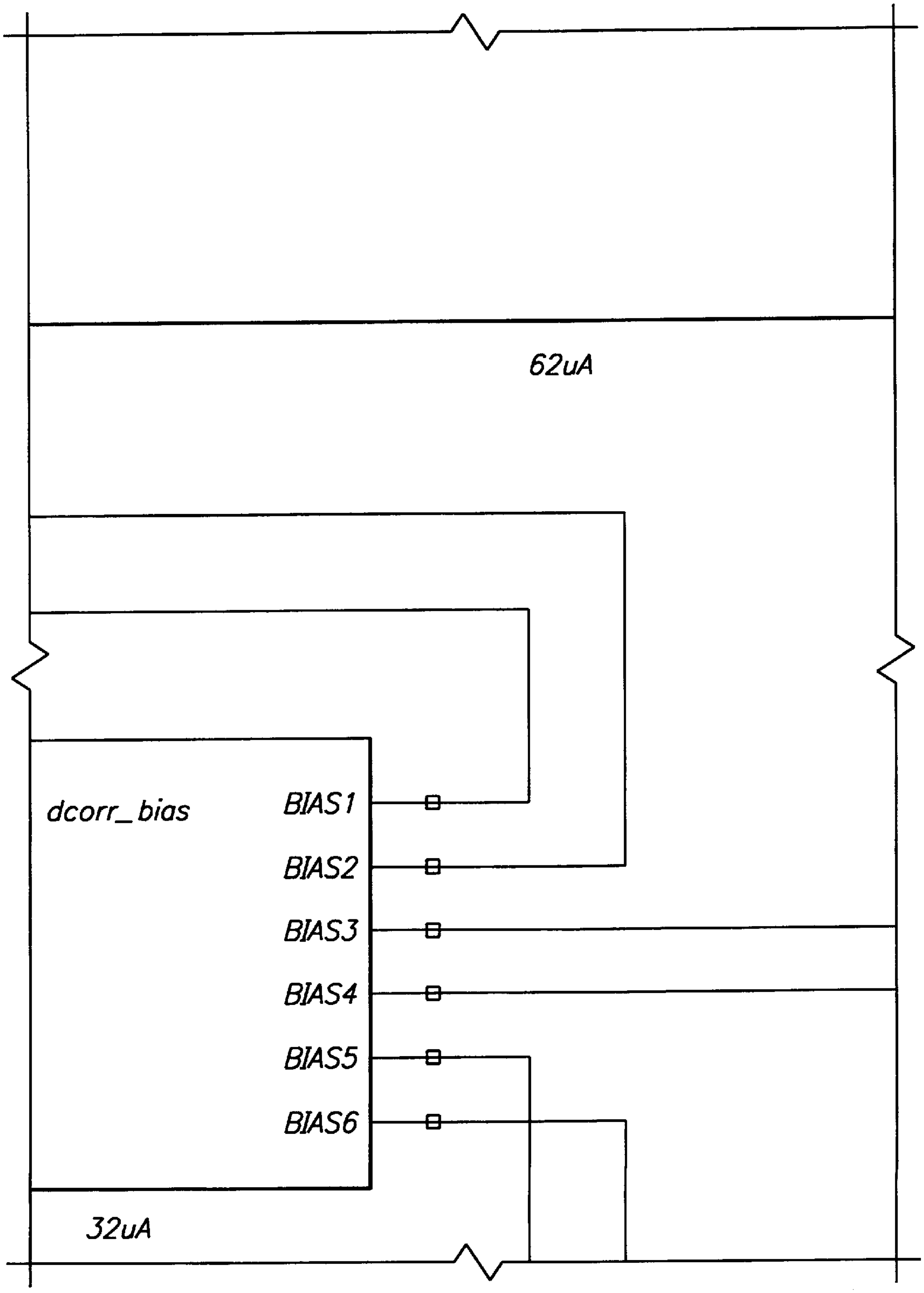
Fig 10.01CB

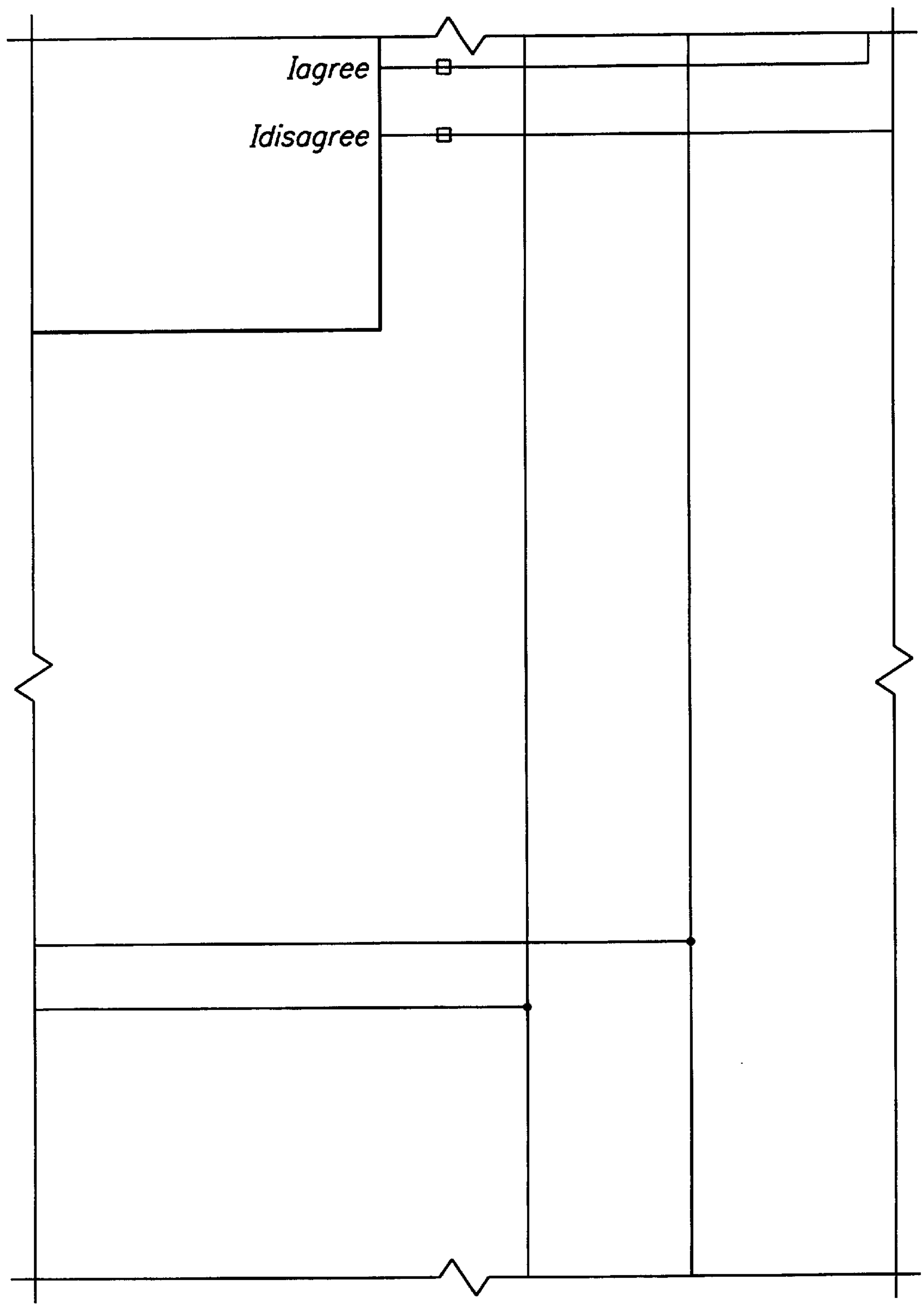
FIG 10.01CC

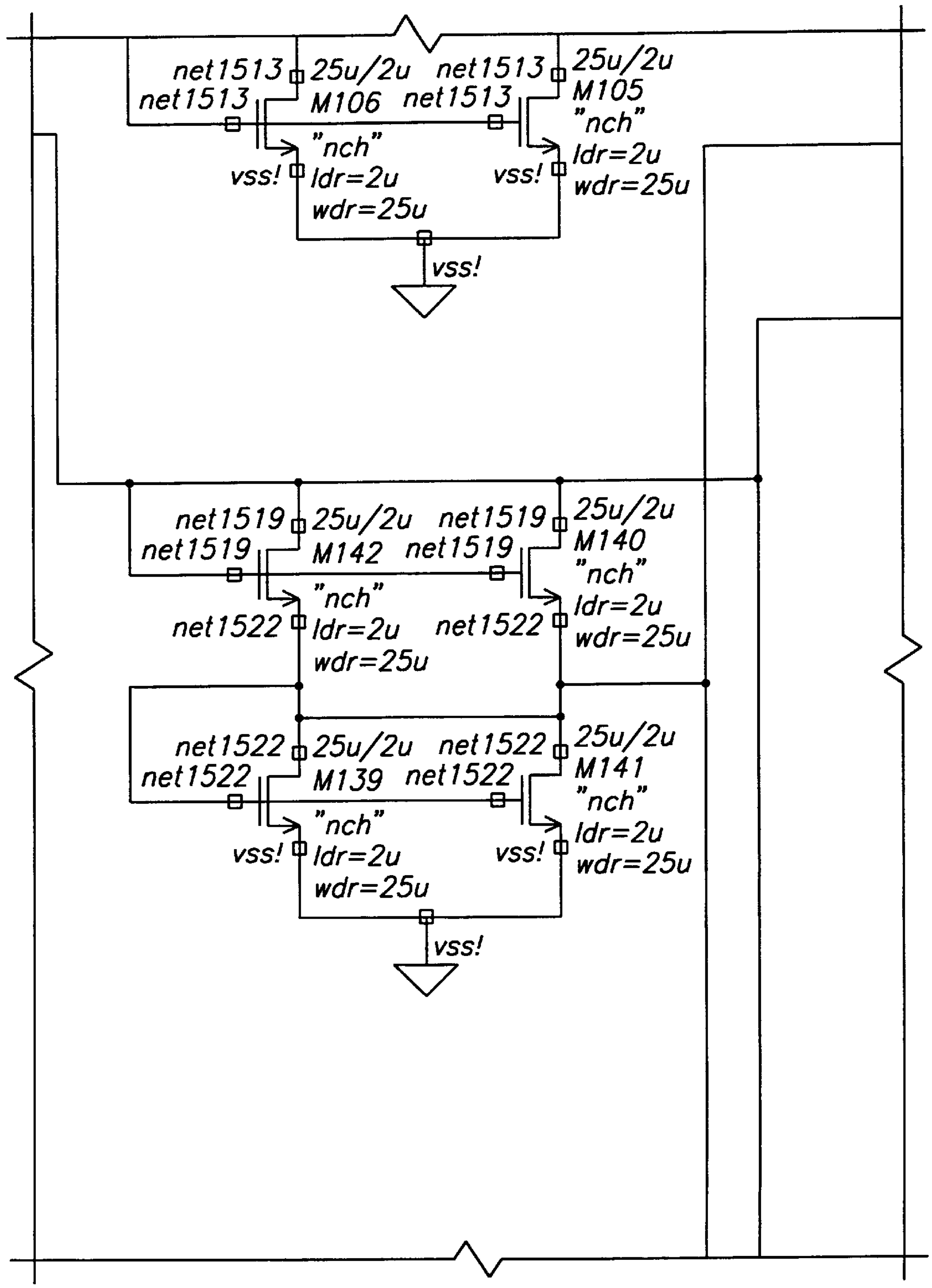
Fig 10.01CD

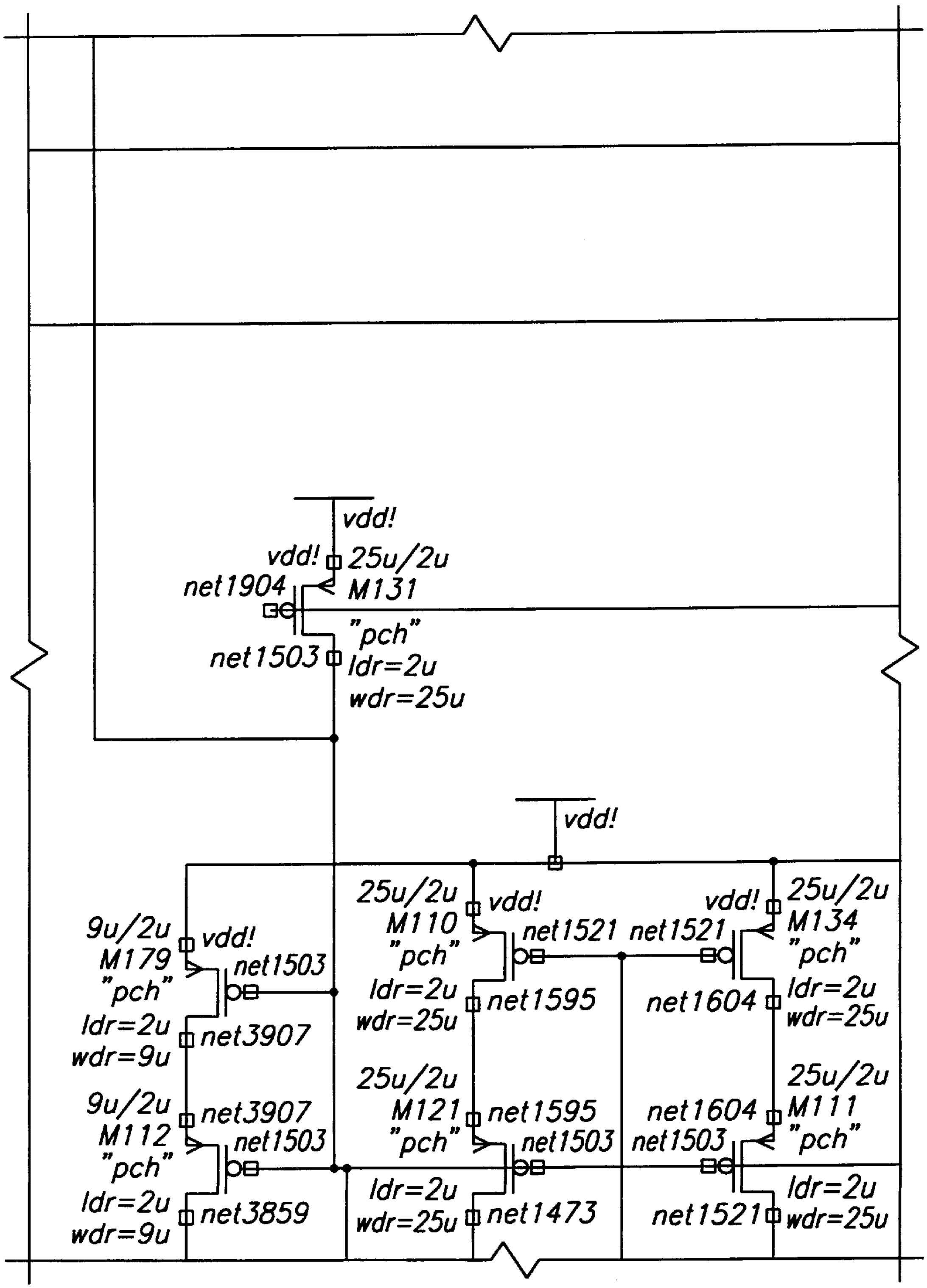
FIG. 10.01CE

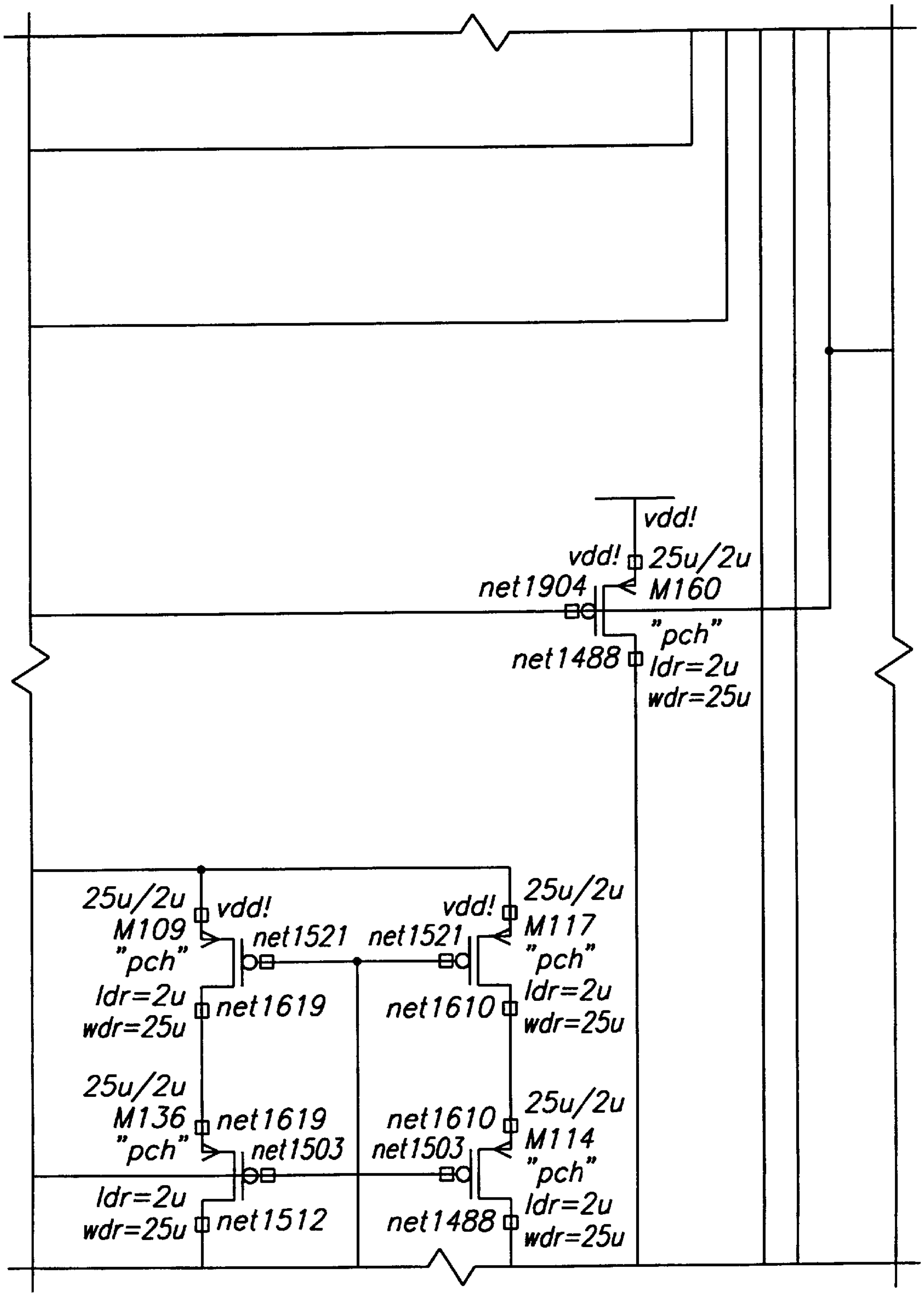
Fig 10.01CF

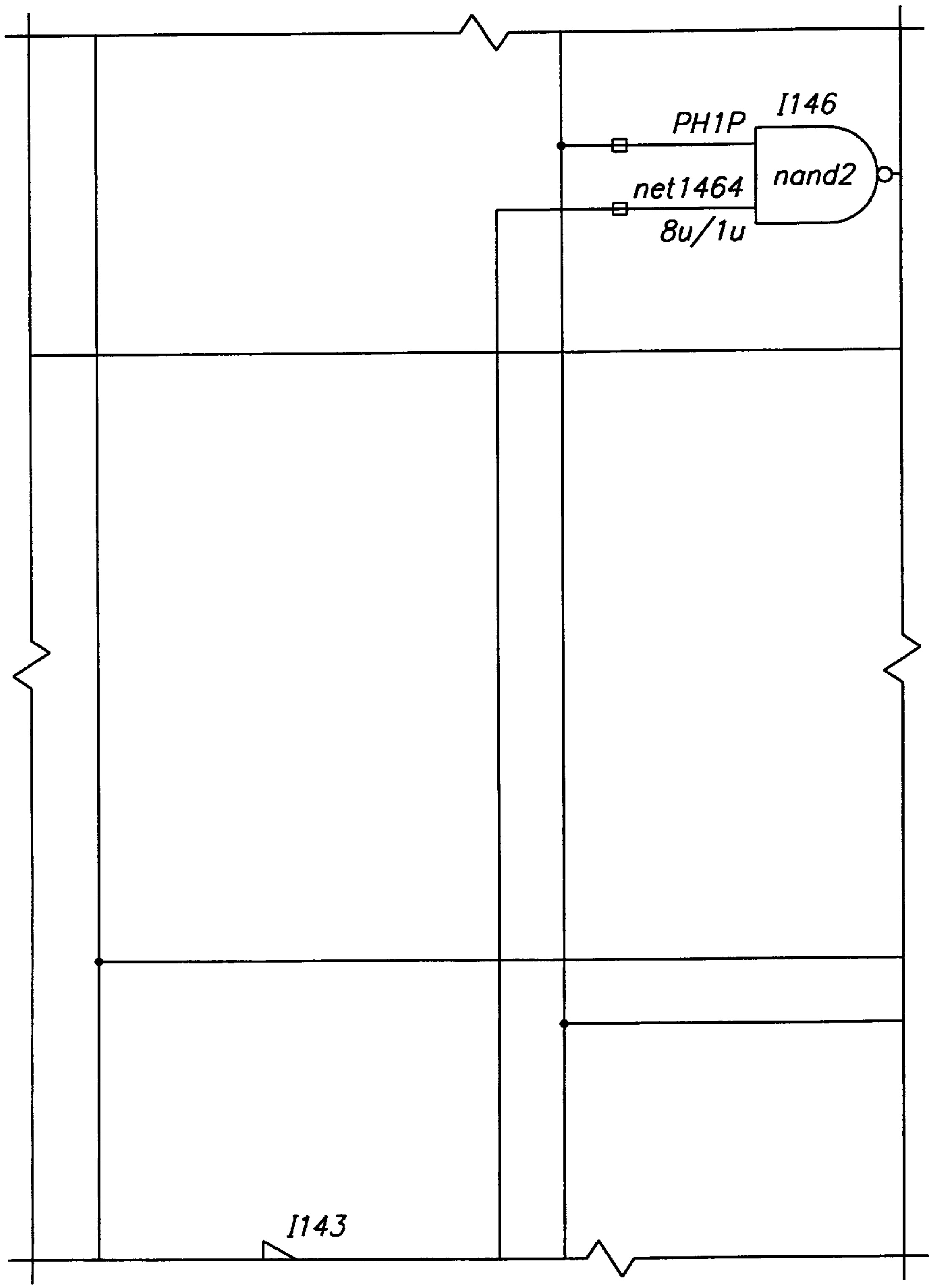
Fig 10.01CG

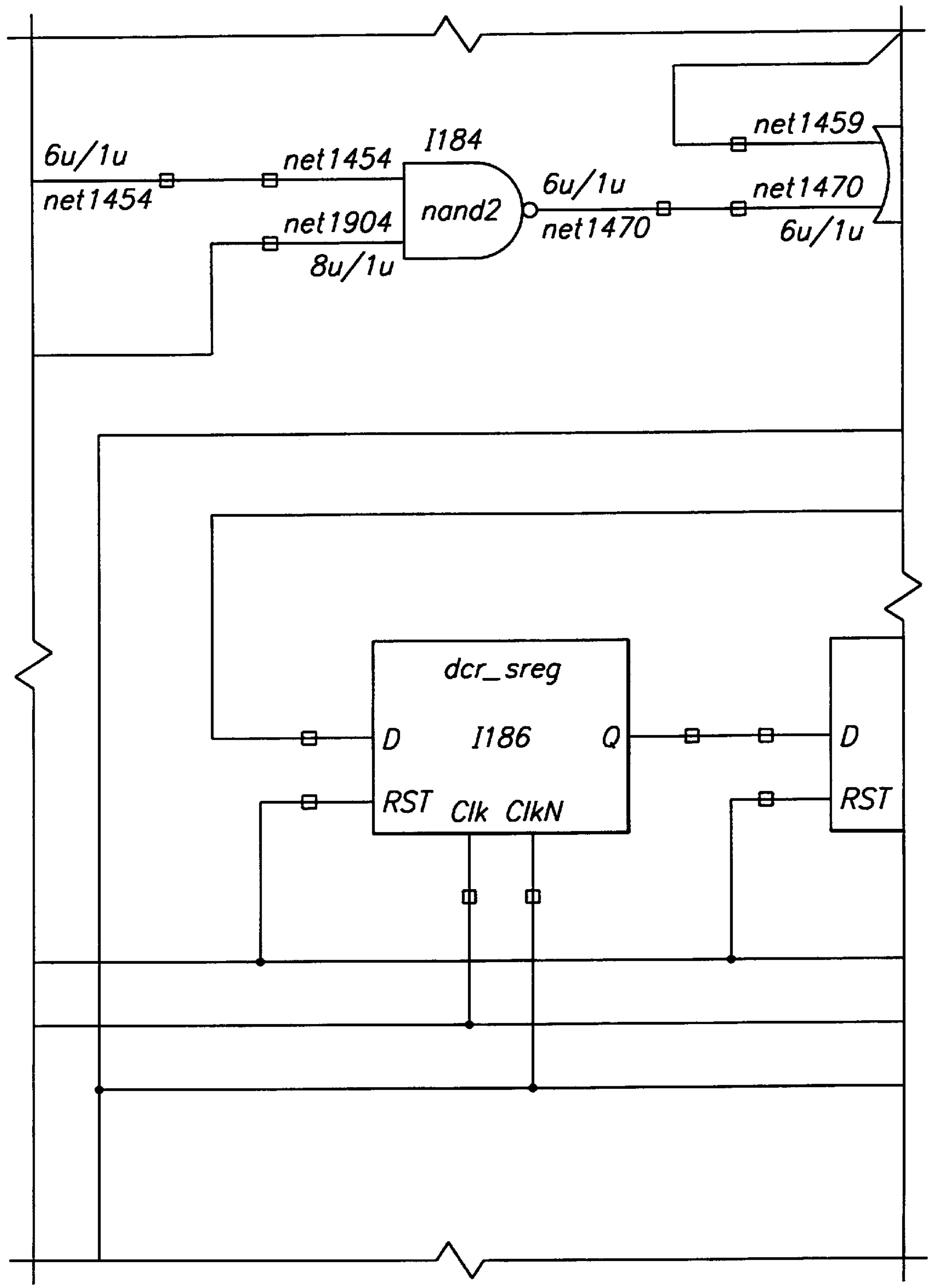
Fig 10.01CH

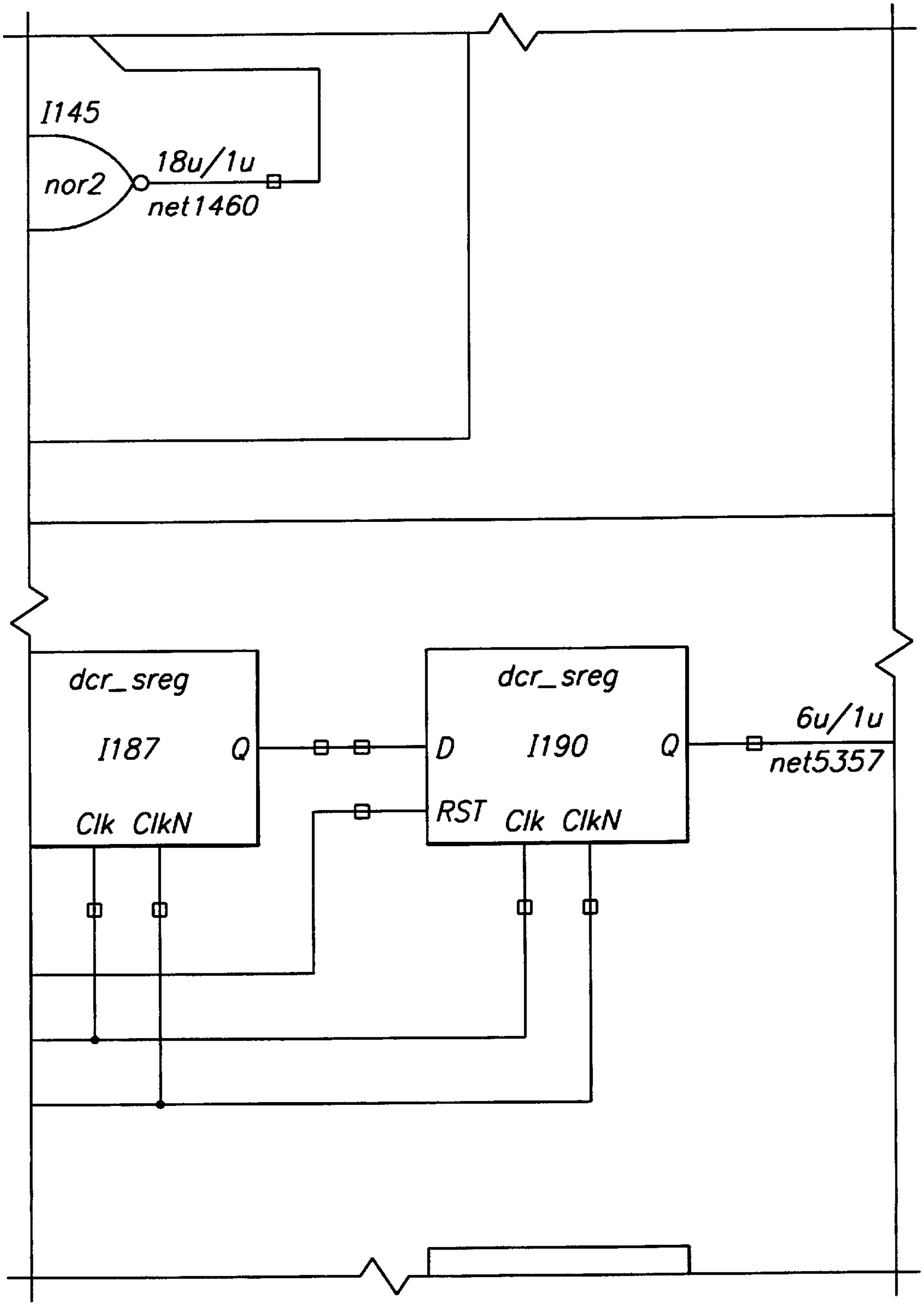
Fig 10.DICI

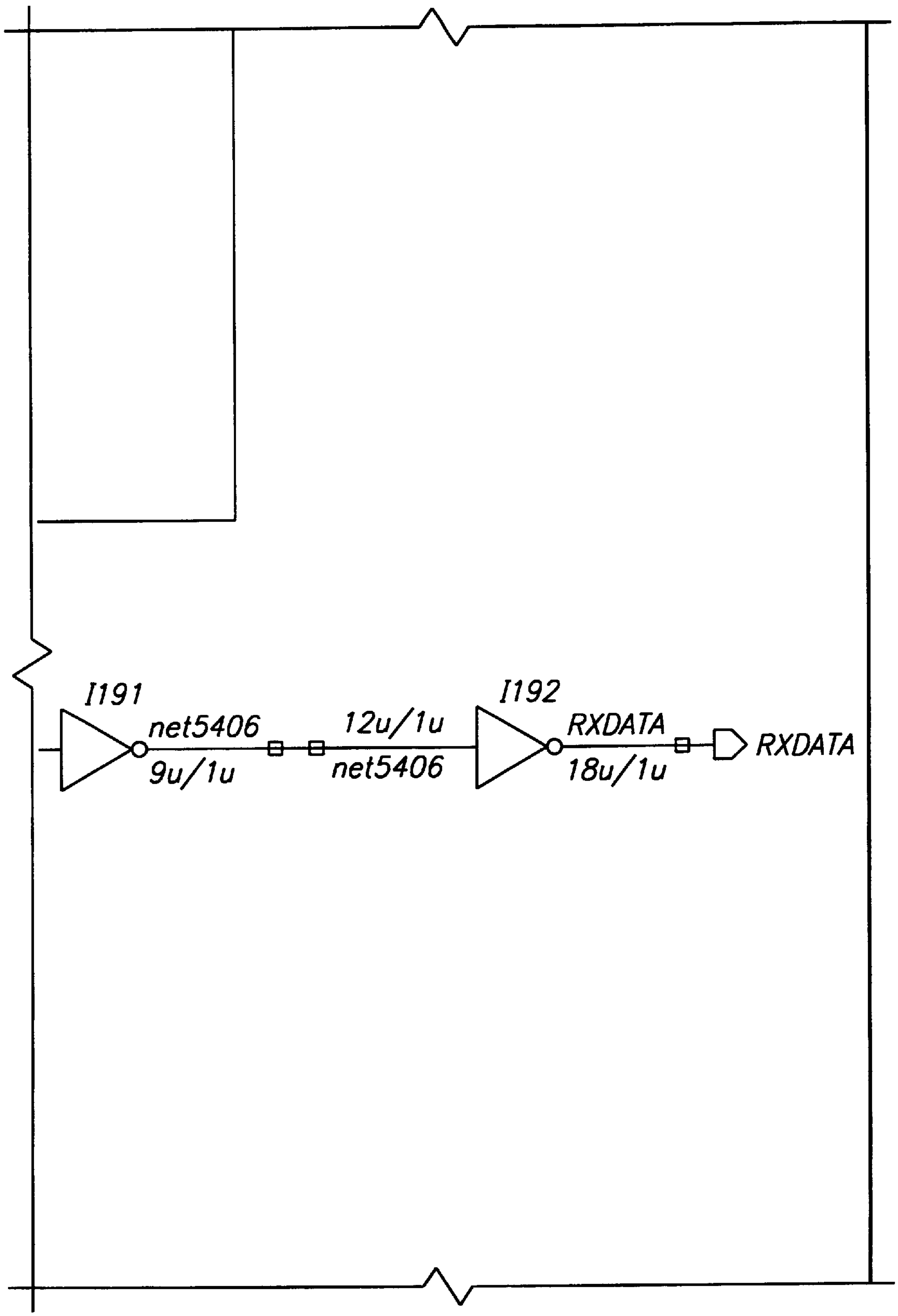
Fig. 10.01Ca

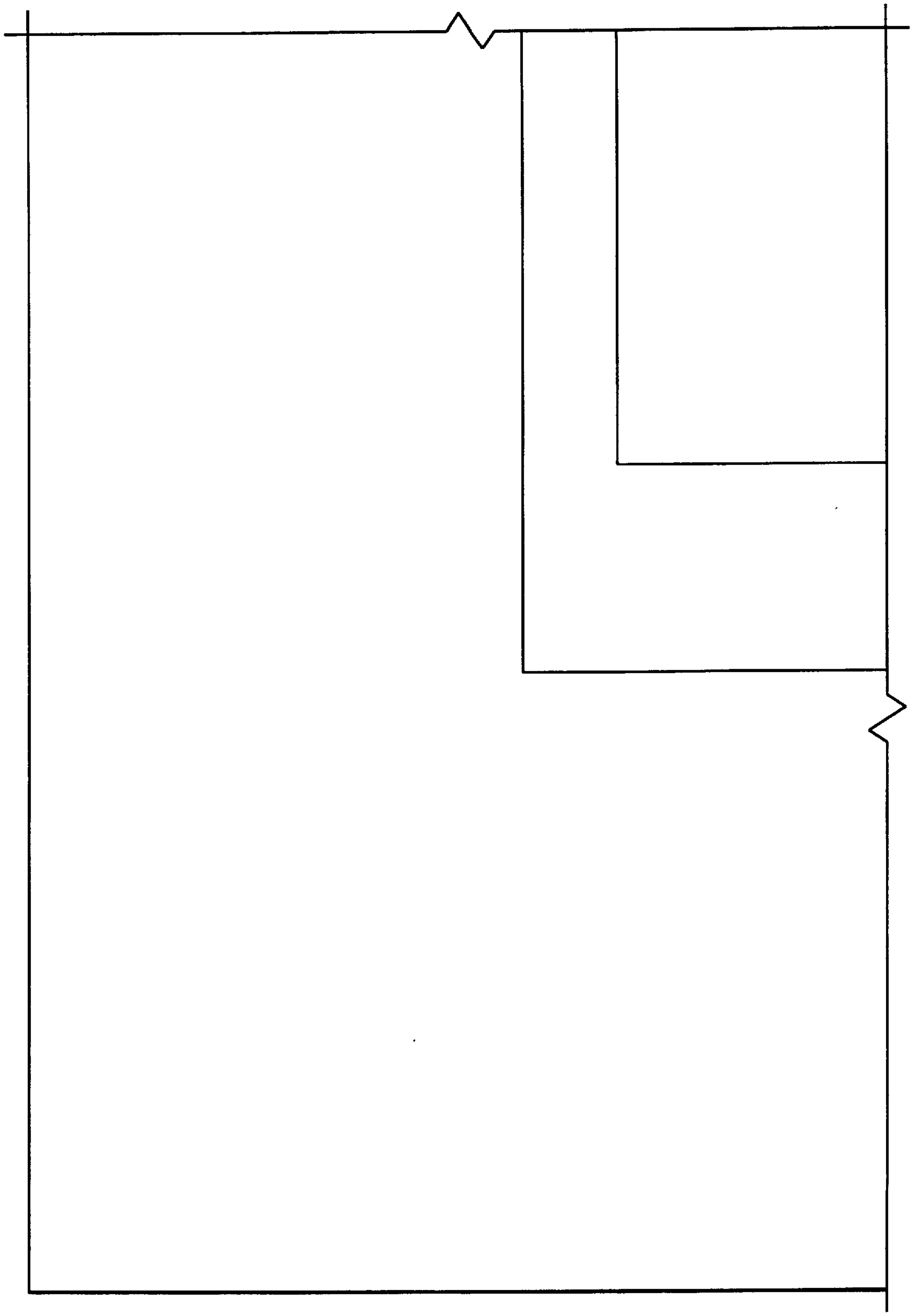
Fig 10.01DB

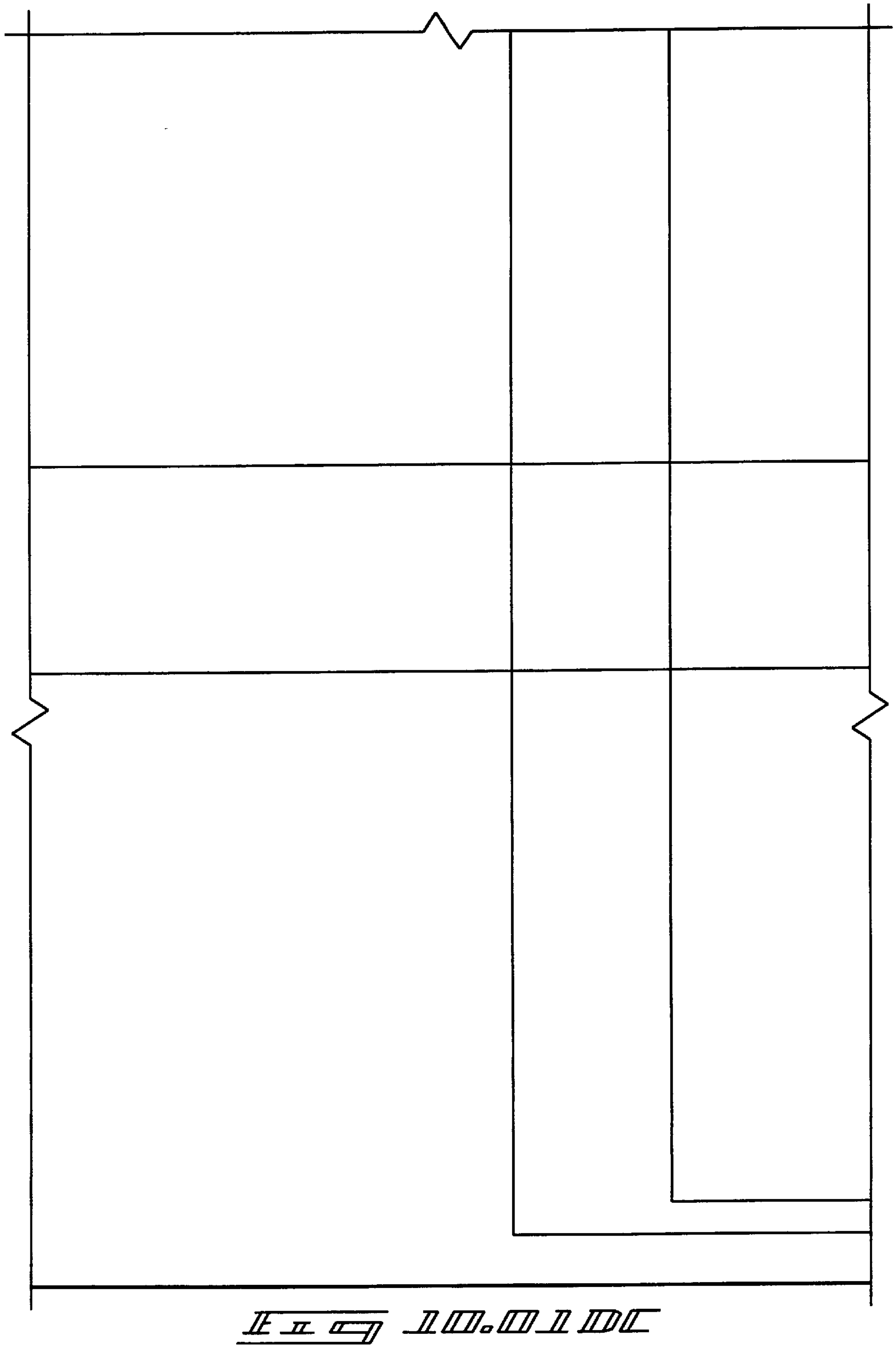
Fig 10.01DC

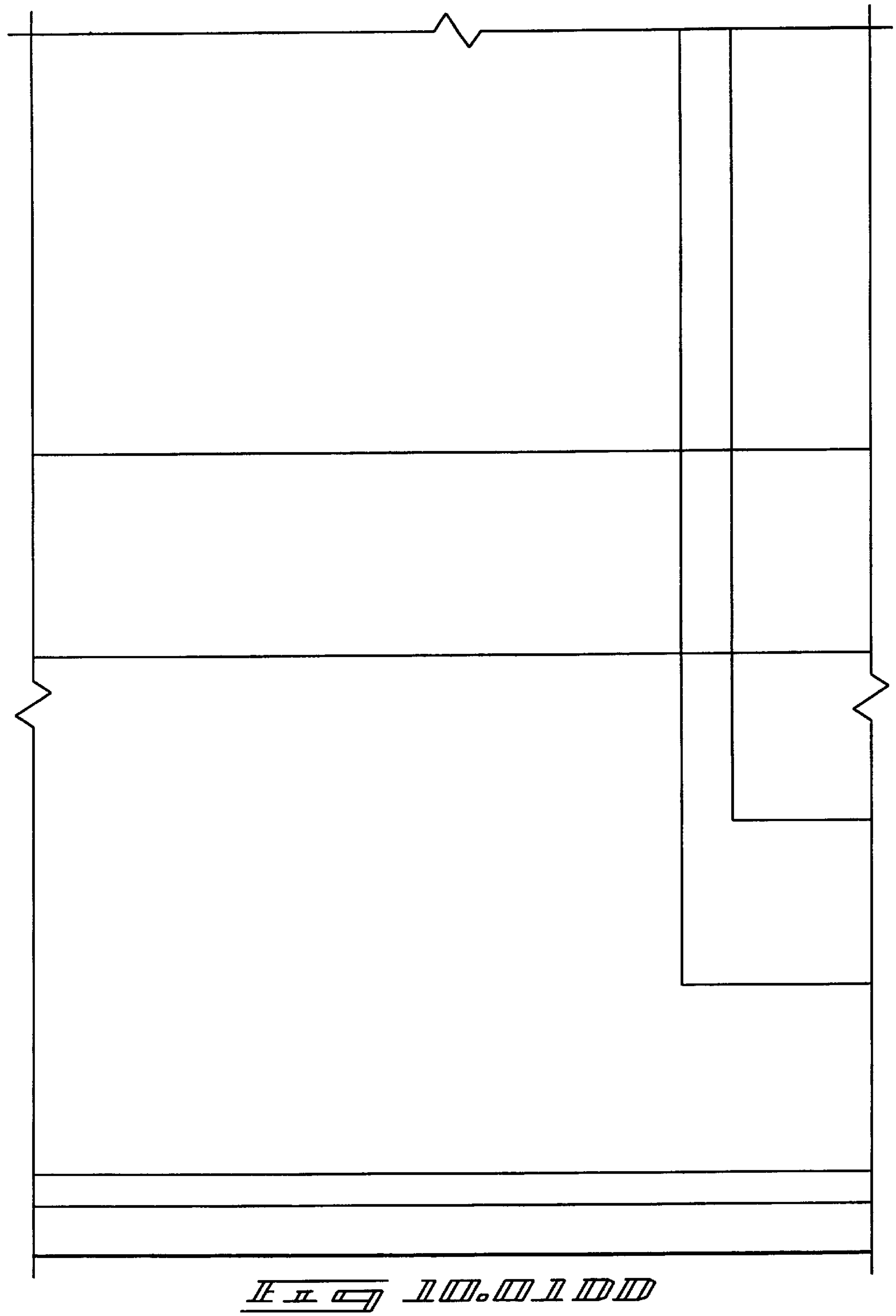
Fig 10.01DD

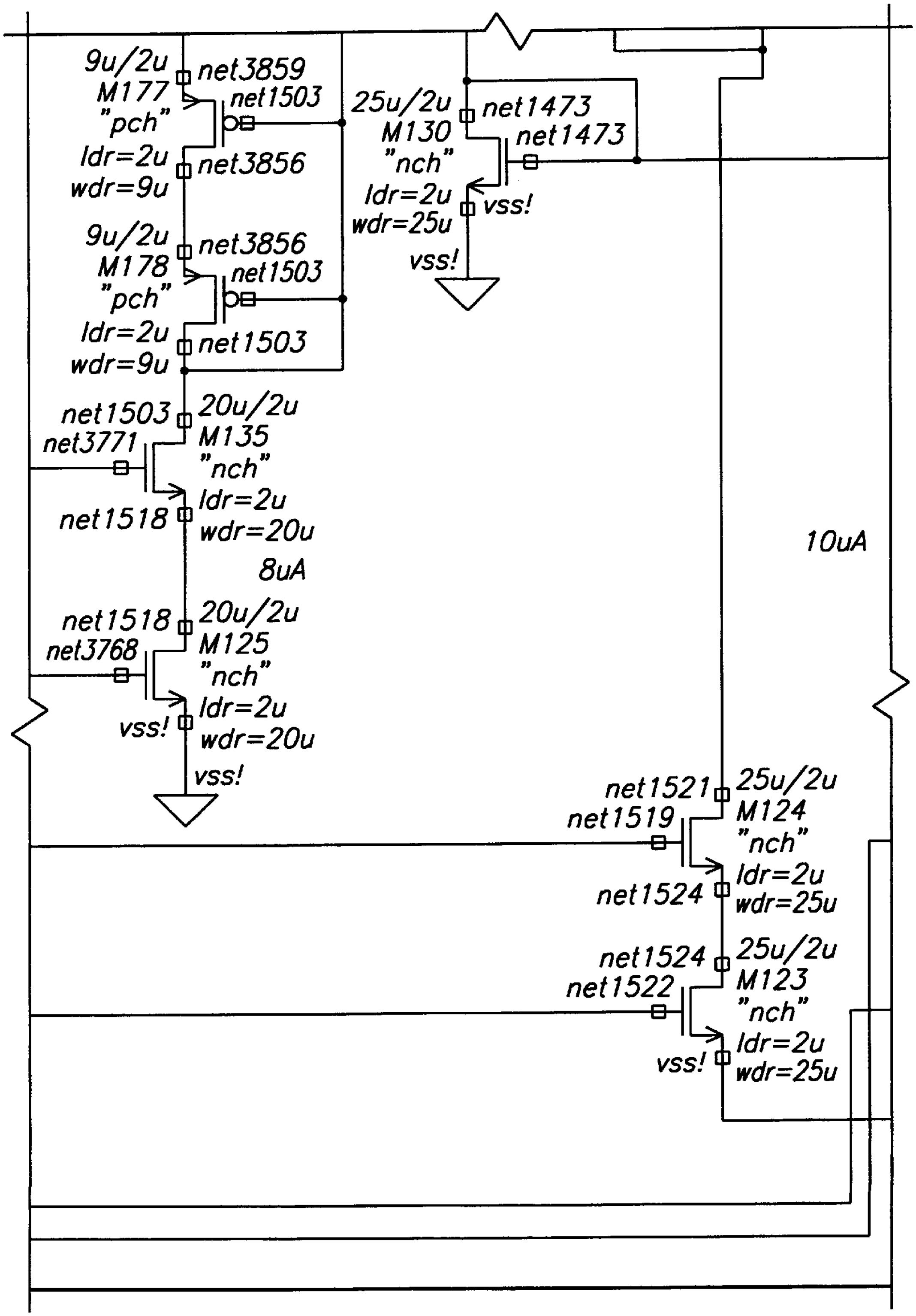
Fig 10.01DE

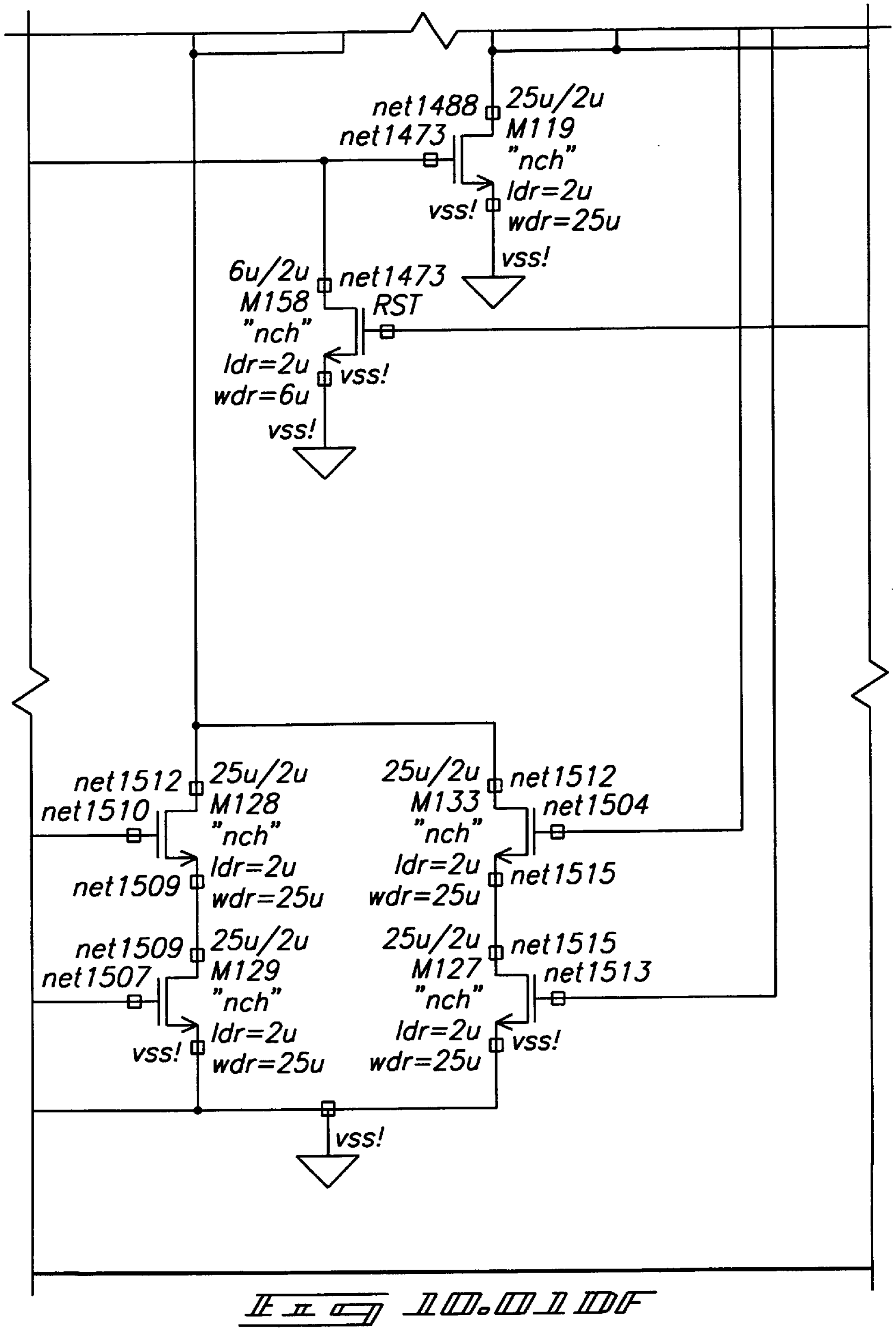
Fig 10.01DF

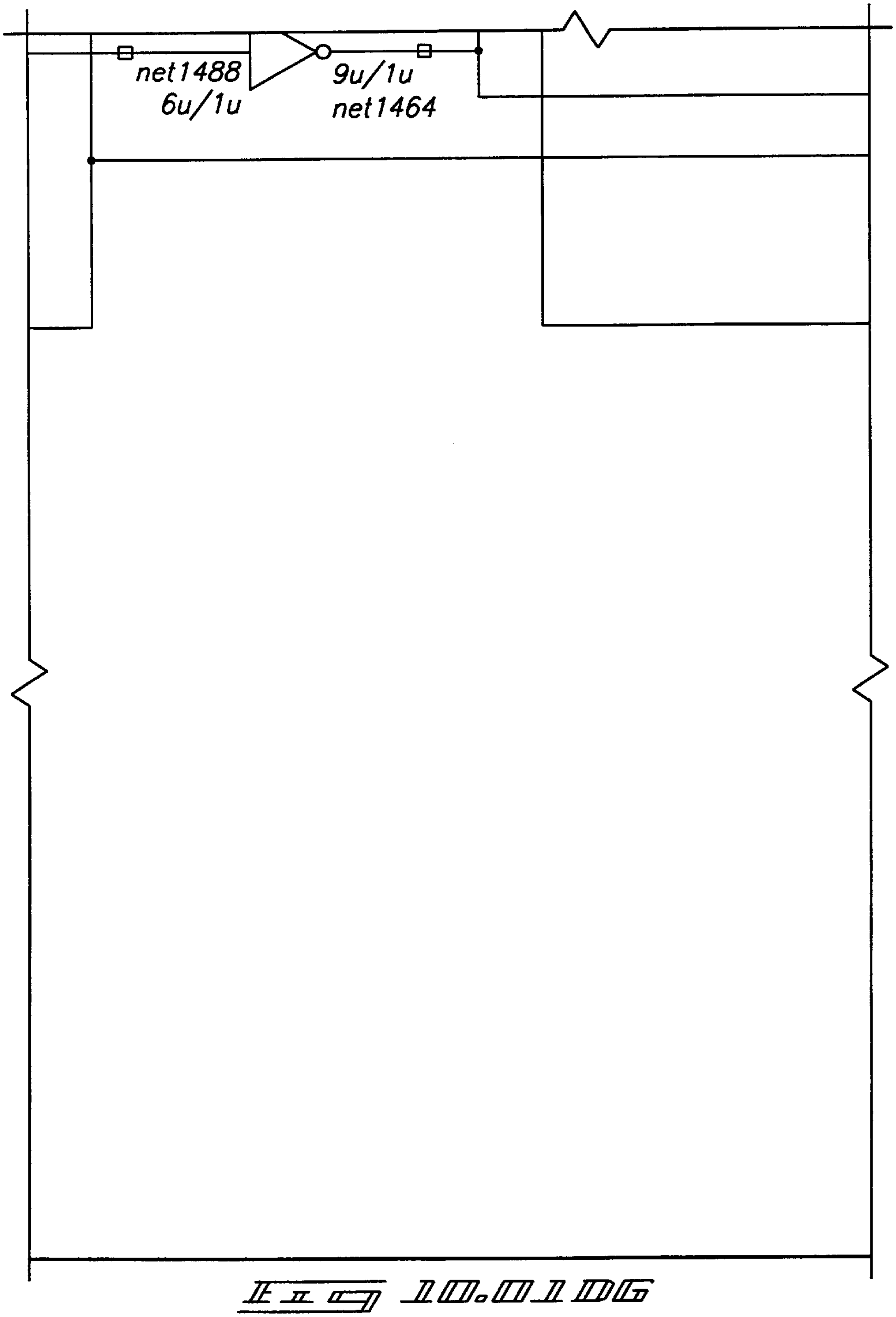
Fig 10.01DG

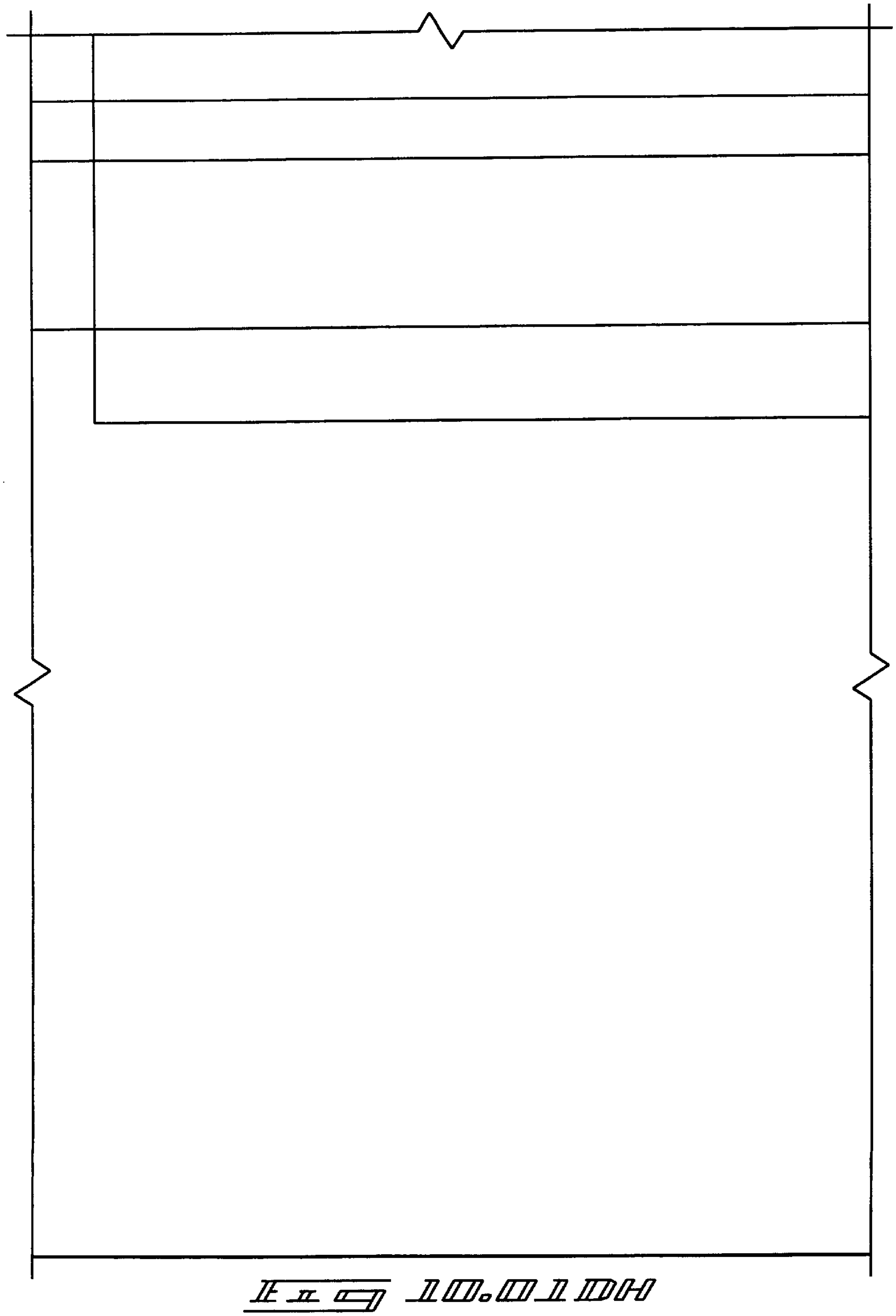
Fig 10.01DH

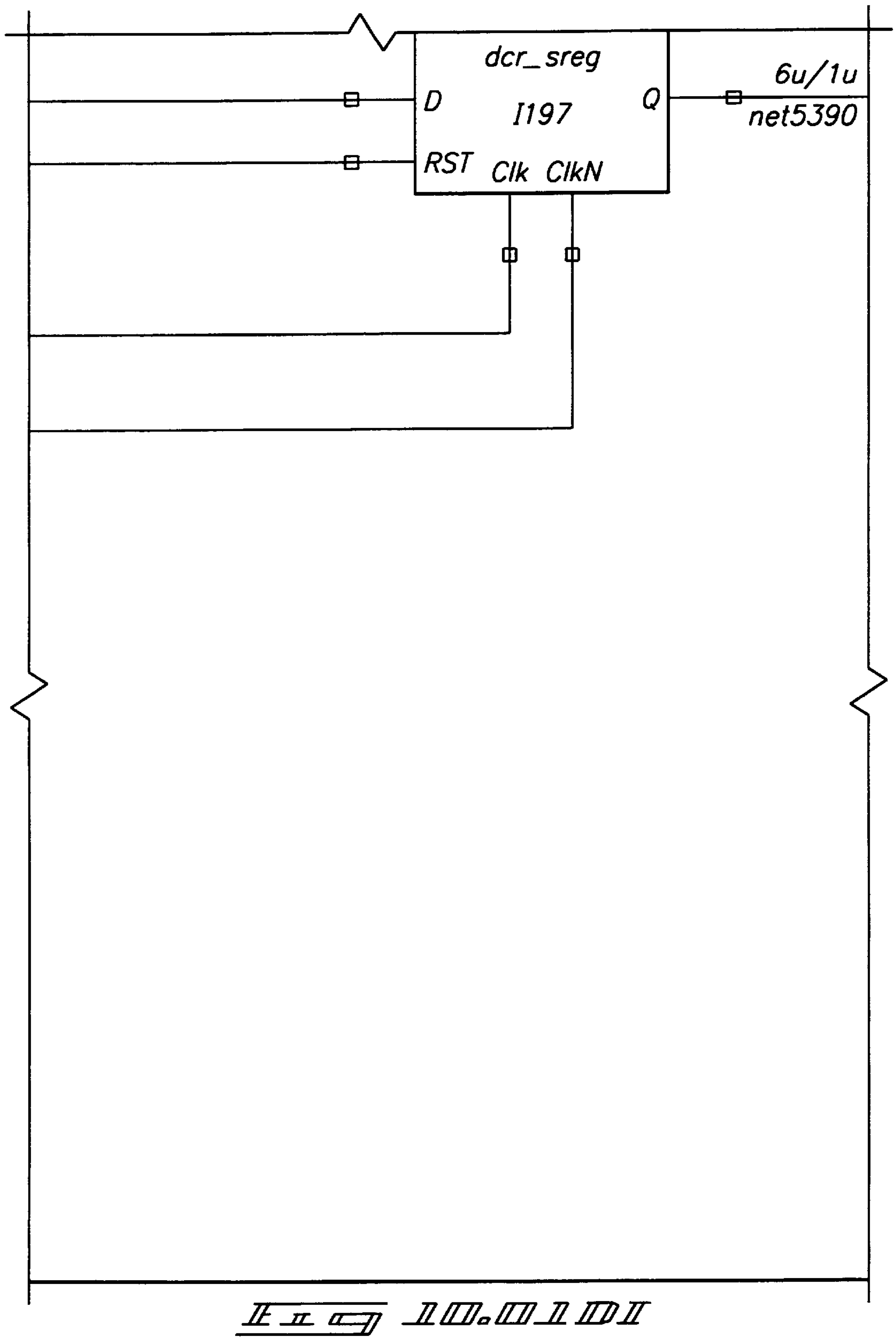
Fig 10.CC1DI

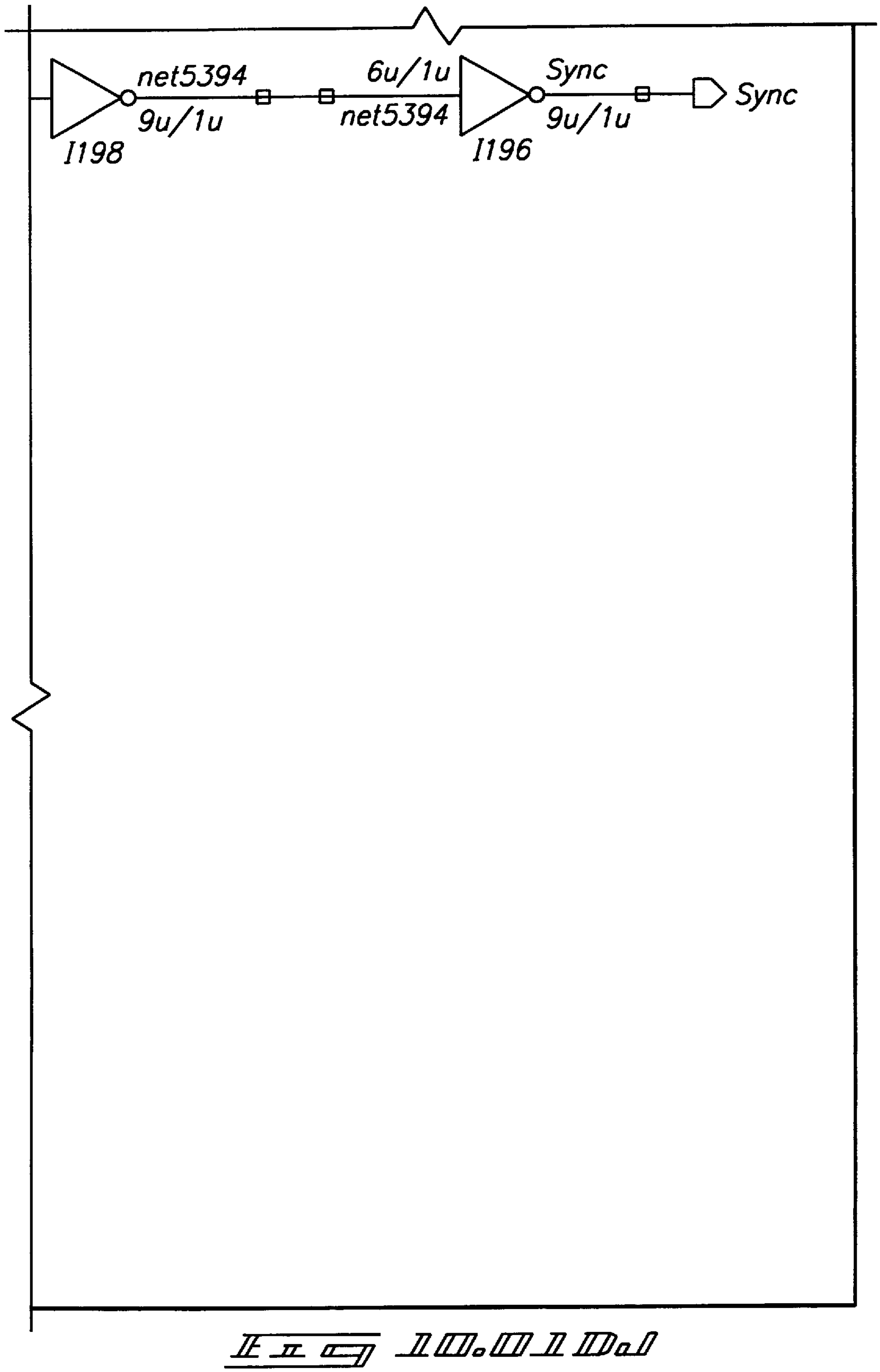
Fig. 100.01D.1

| | | | | | | |
|---|---|---|---|---|---|---|
| 10.0101AA | 10.0101AB | 10.0101AC | 10.0101AD | 10.0101AE | 10.0101AF | 10.0101AG |
| 10.0101BA | 10.0101BB | 10.0101BC | 10.0101BD | 10.0101BE | 10.0101BF | 10.0101BG |

FIG. 10.0101

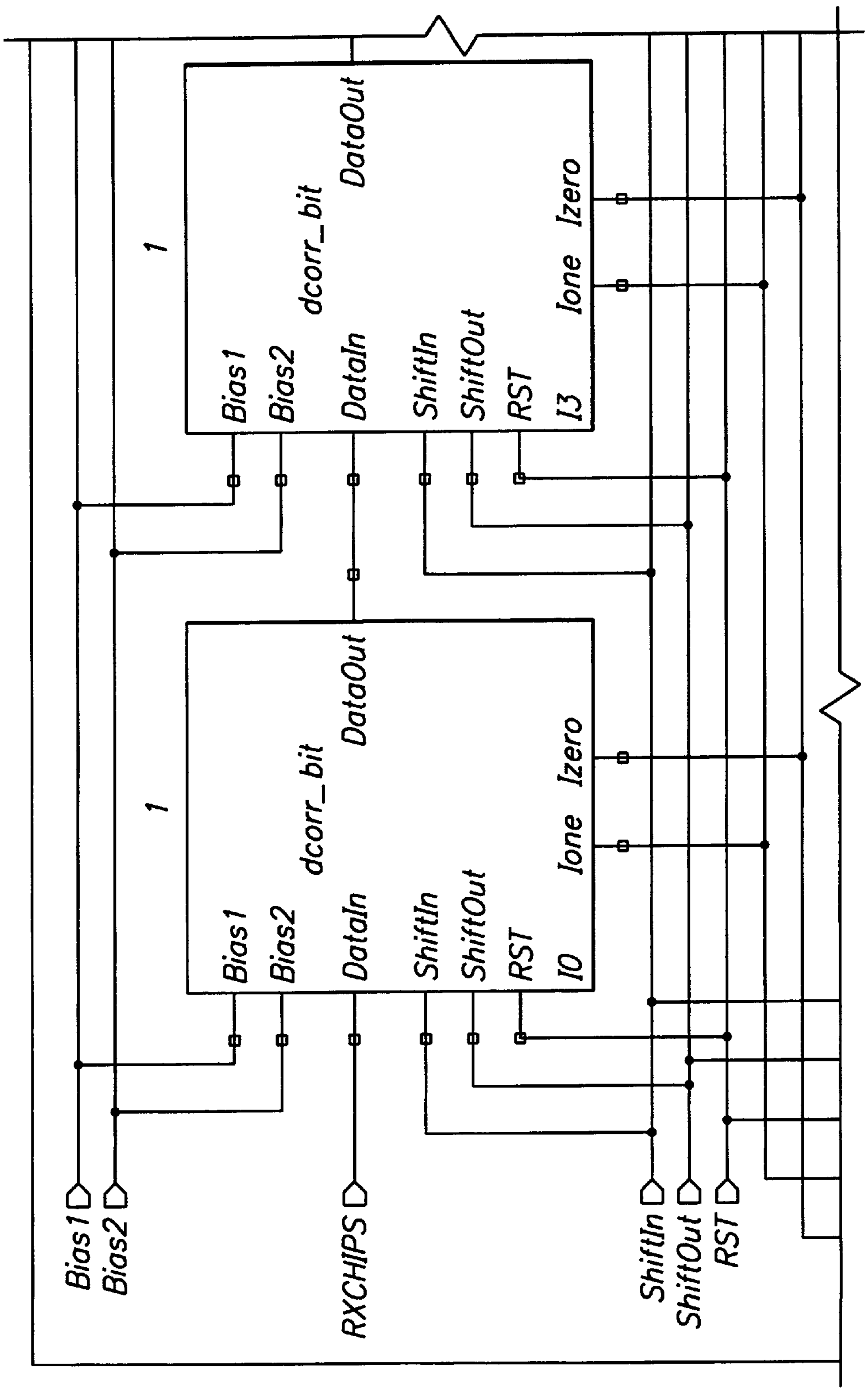
FIG. 10.10.11AA

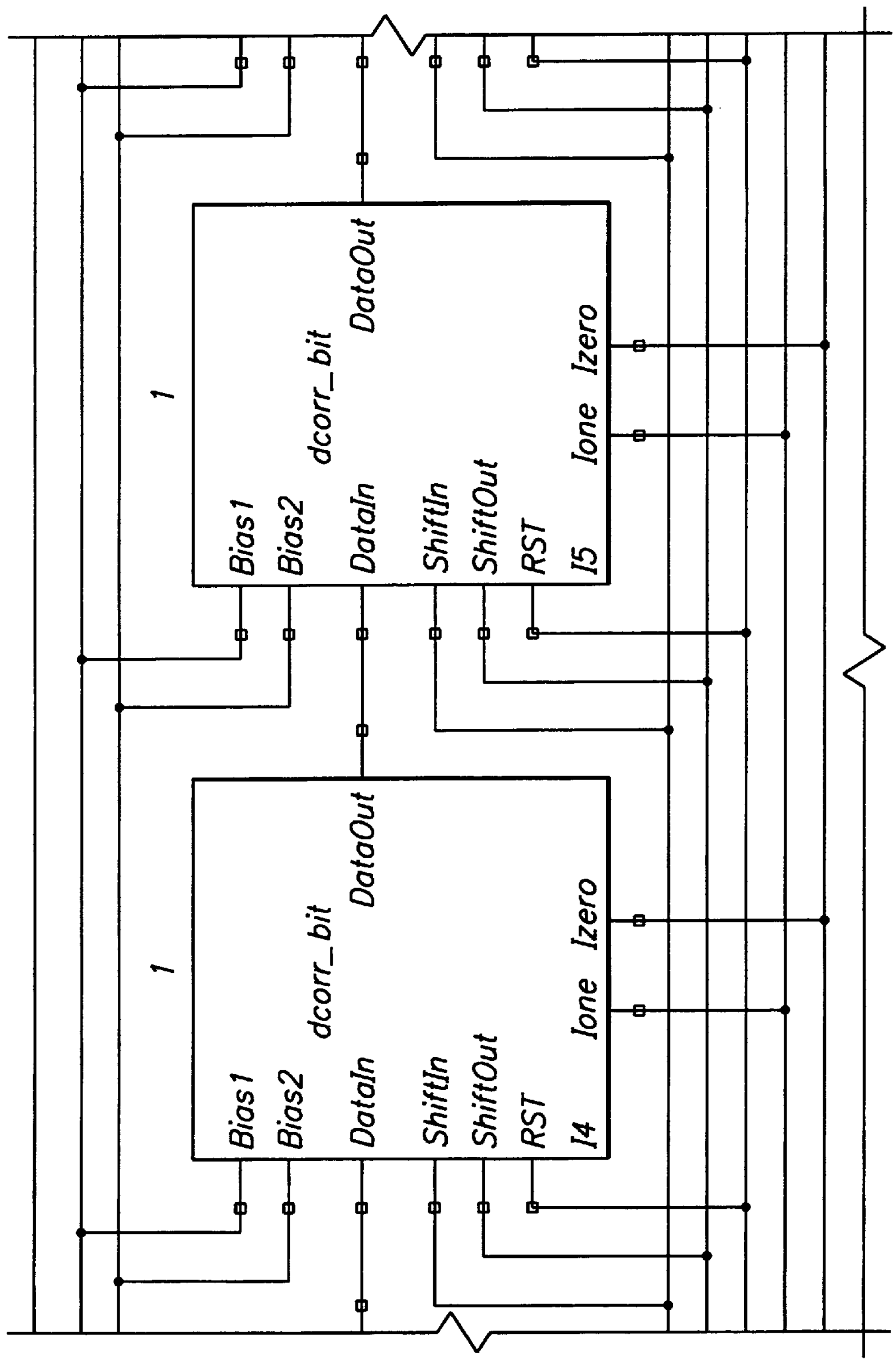
FIG. 110.110AB

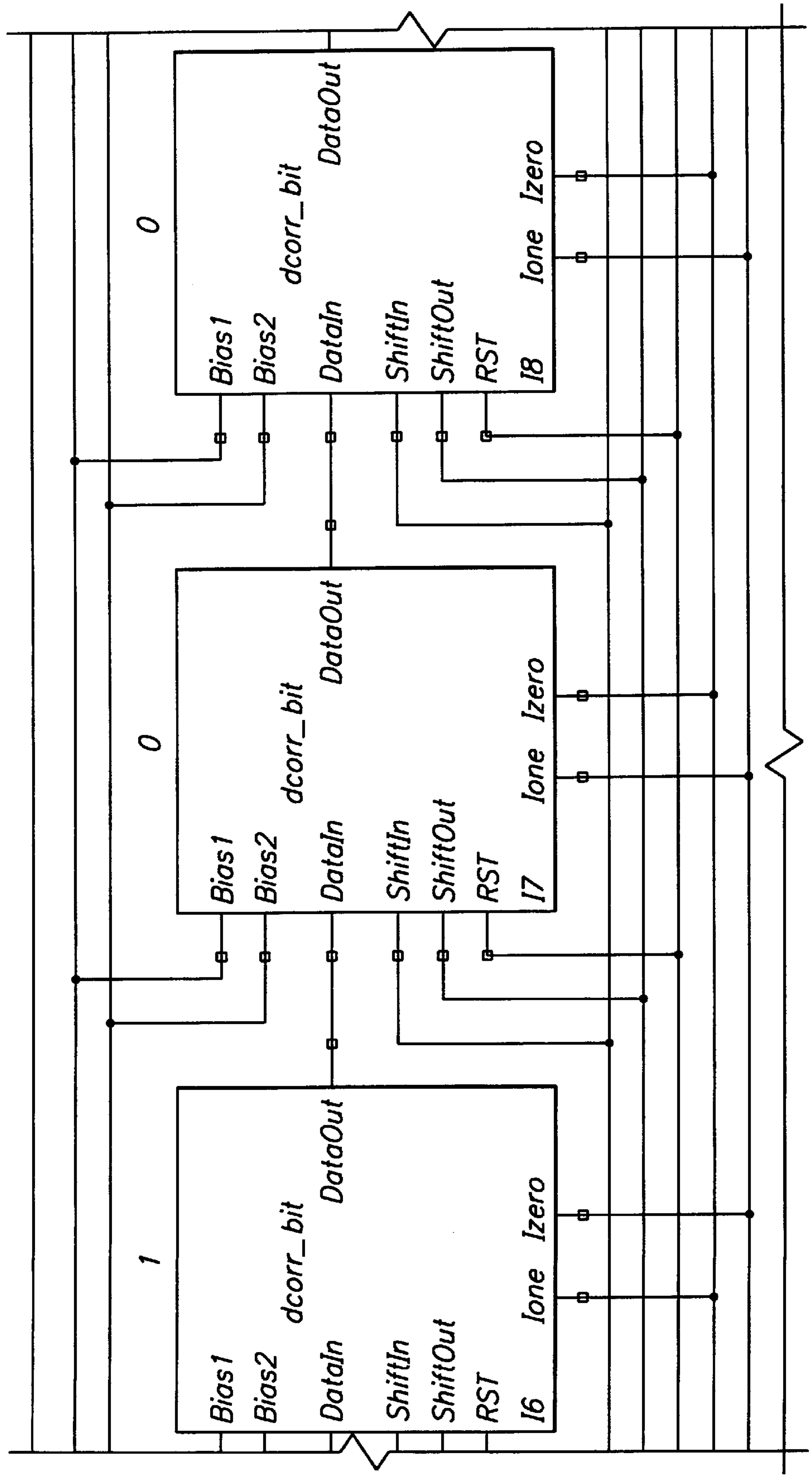
Fig. 10.0101AC

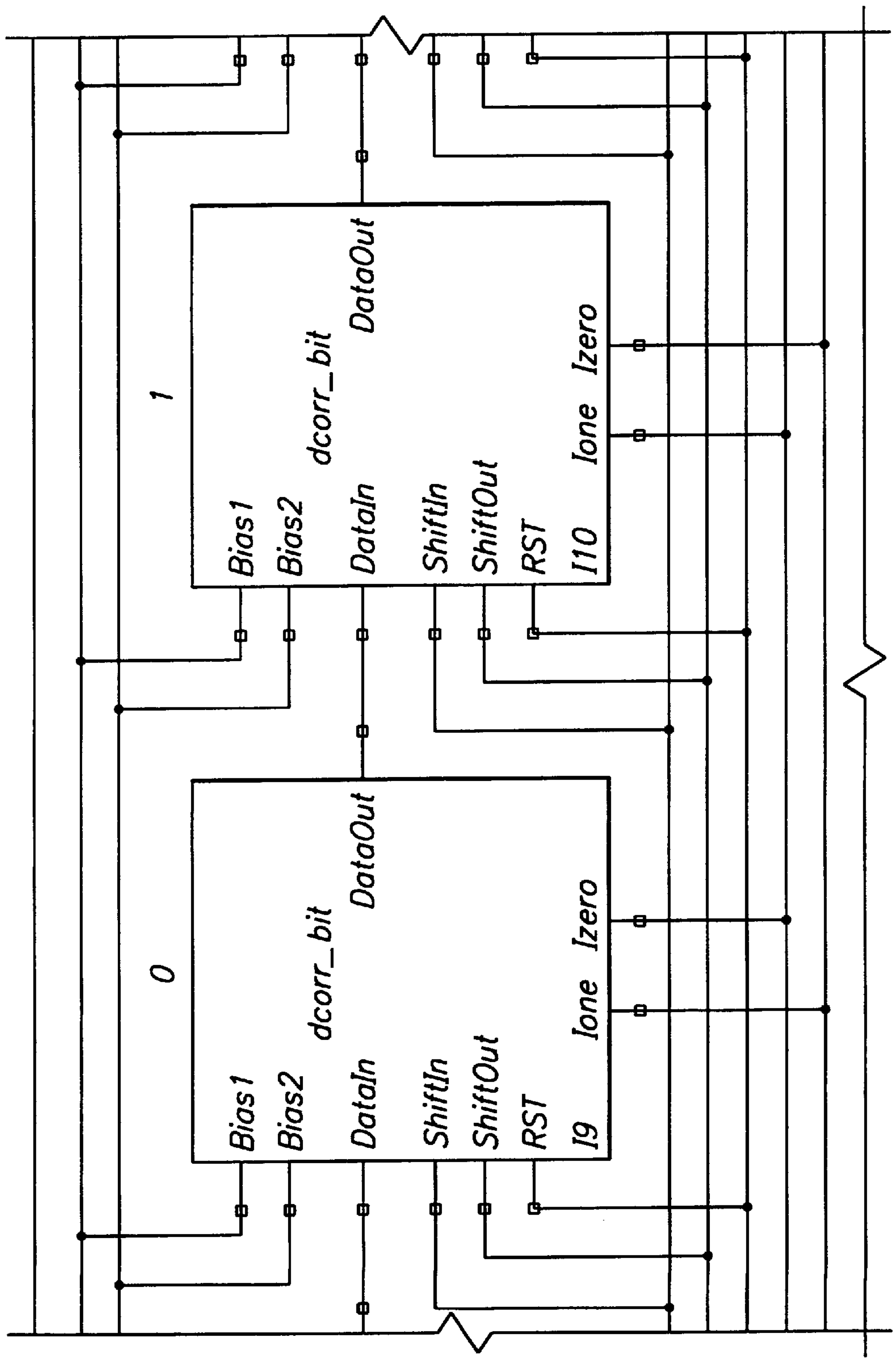
FIG. 10.01010101AD

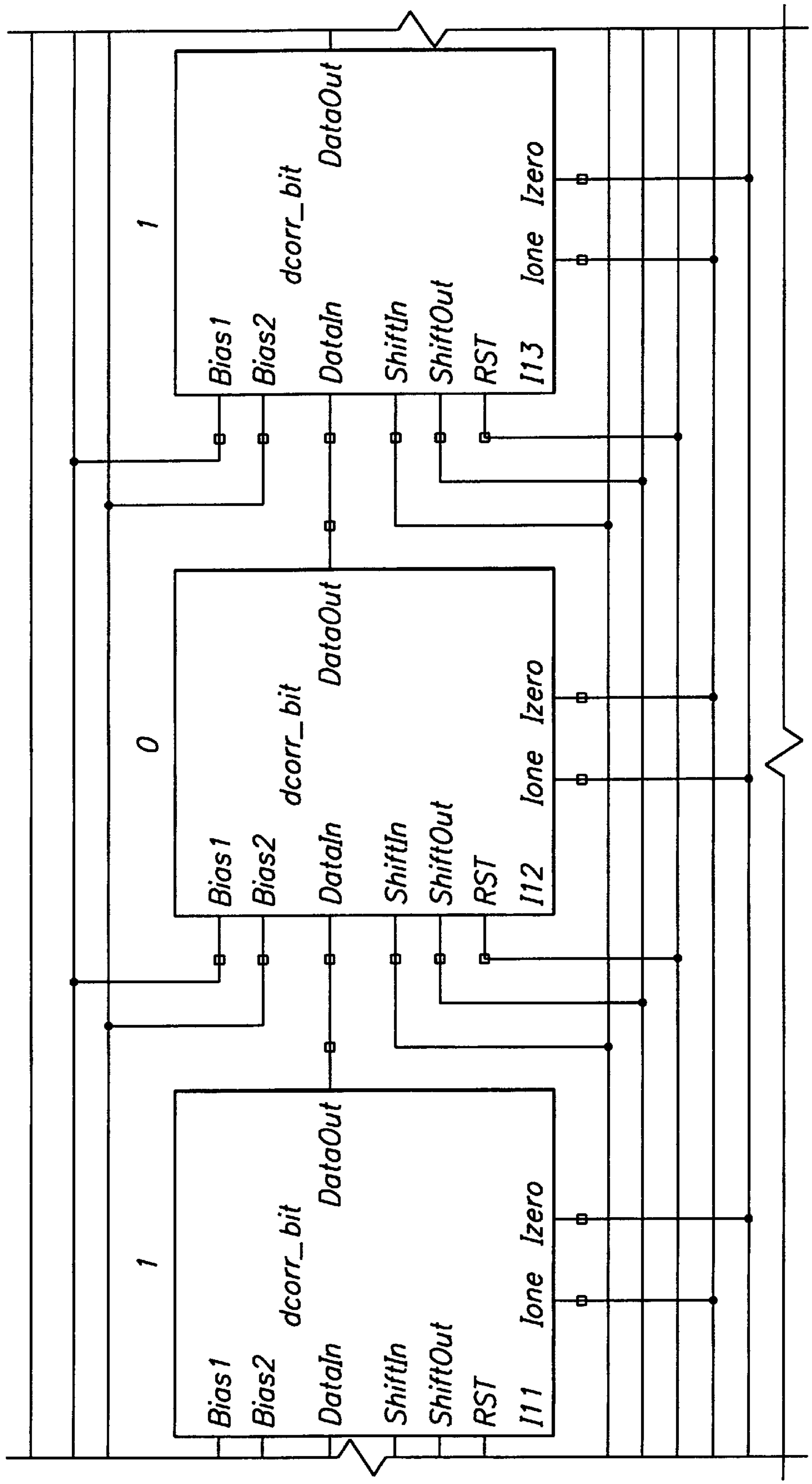
Fig. 10.0101AE

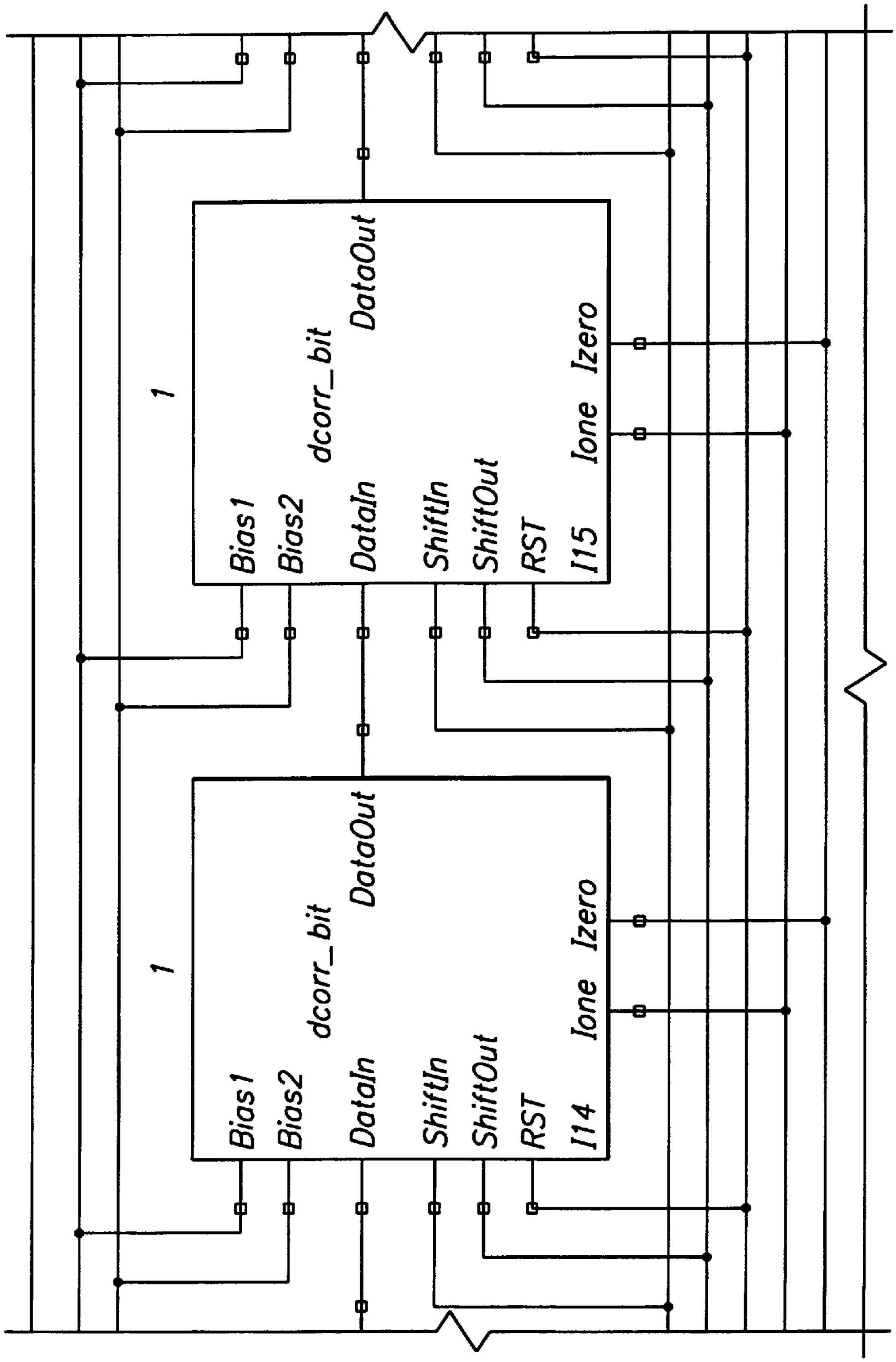
FIG_10.0101AF

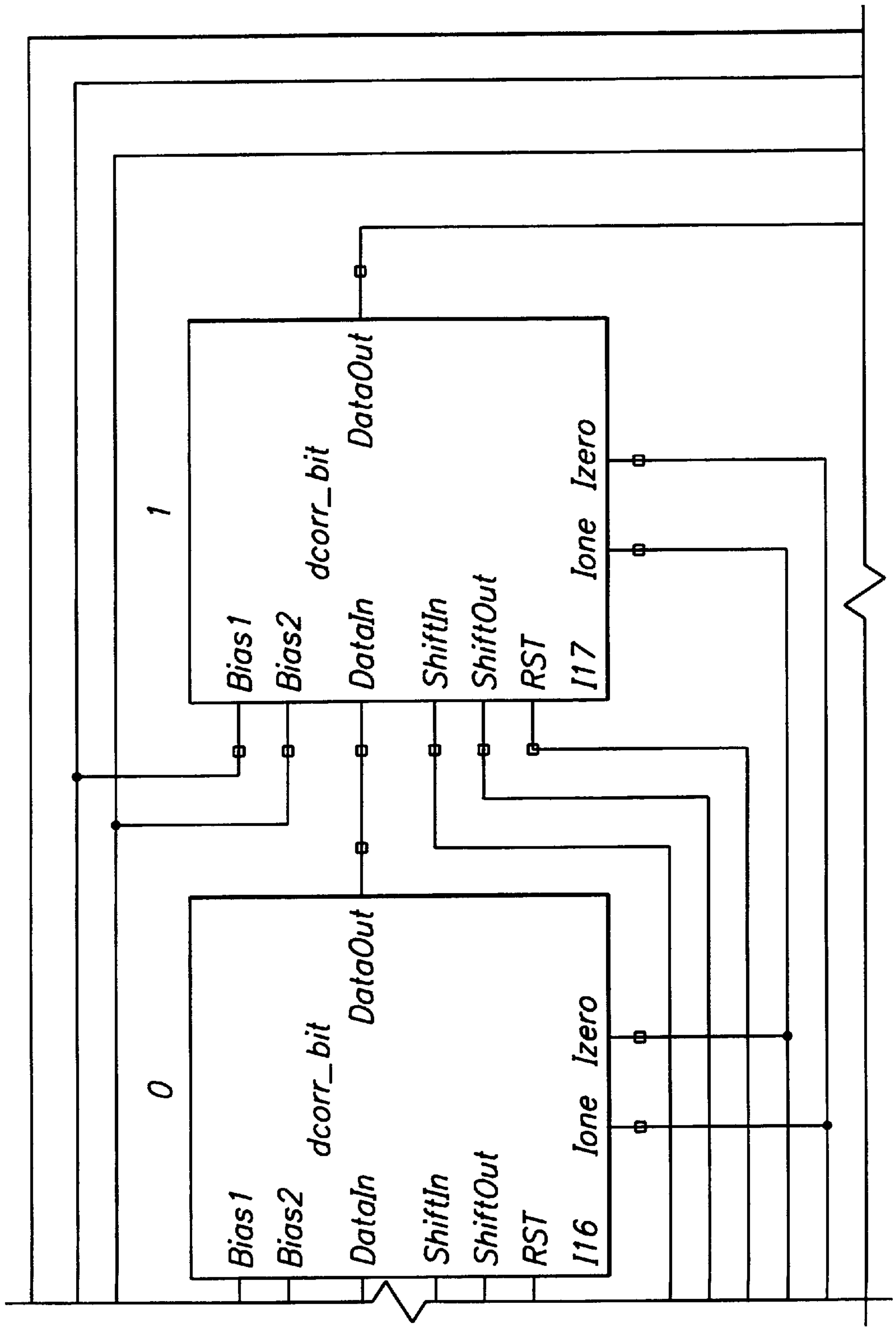
Fig. 10.0110AG

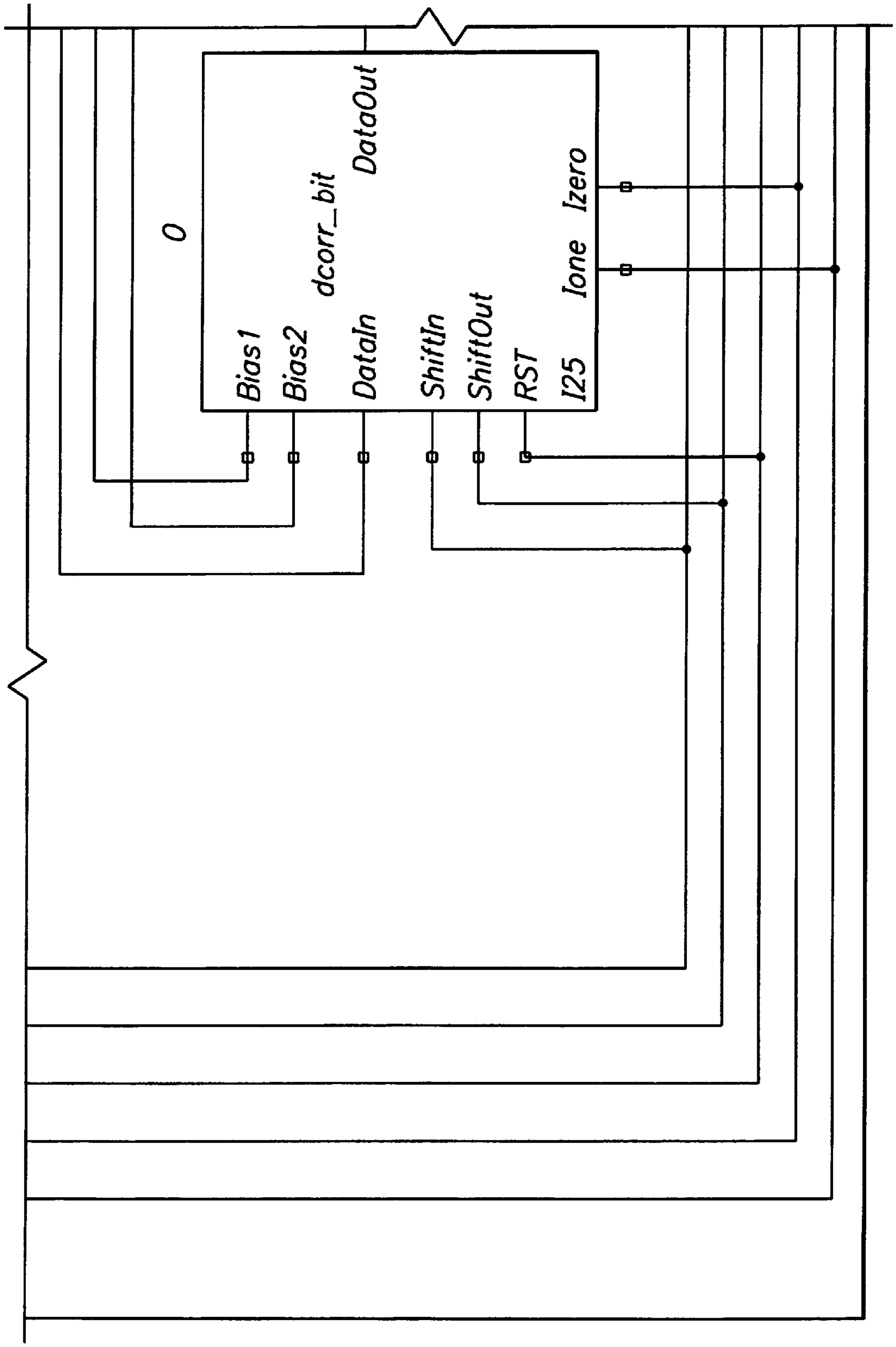
FIG. 10.0101BA

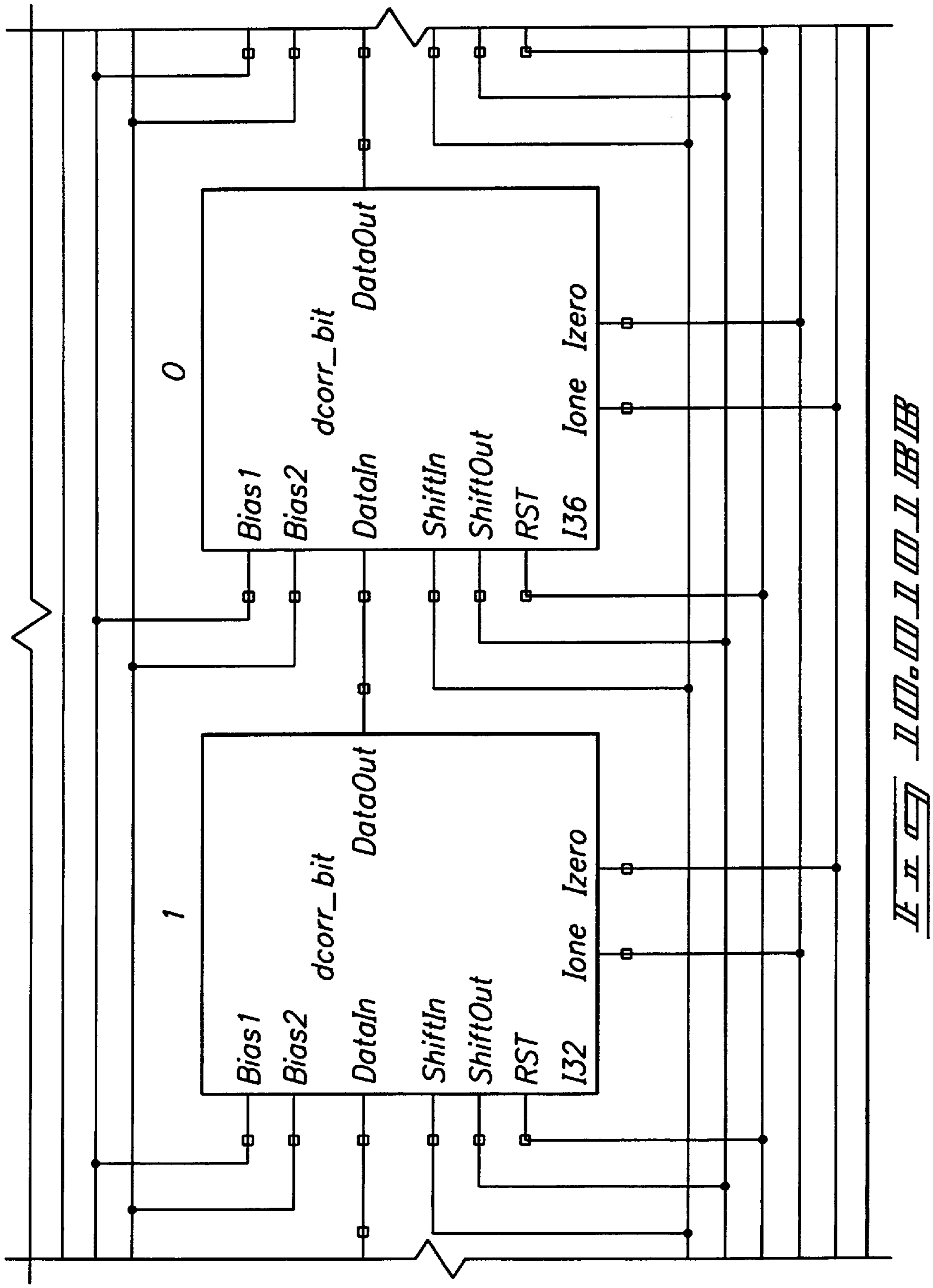
FIG. 10.0.101B

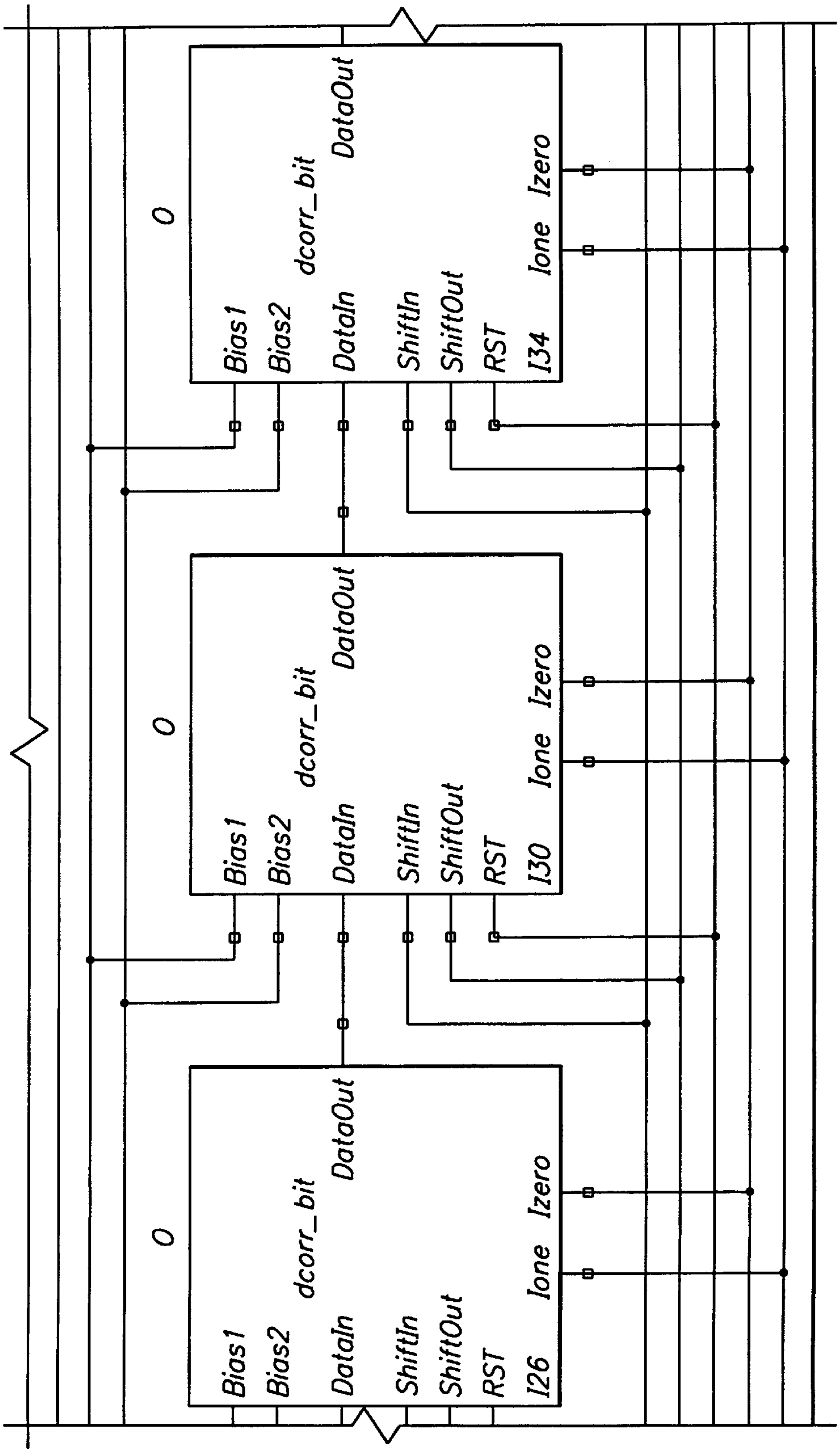
FIG. 10.01BC

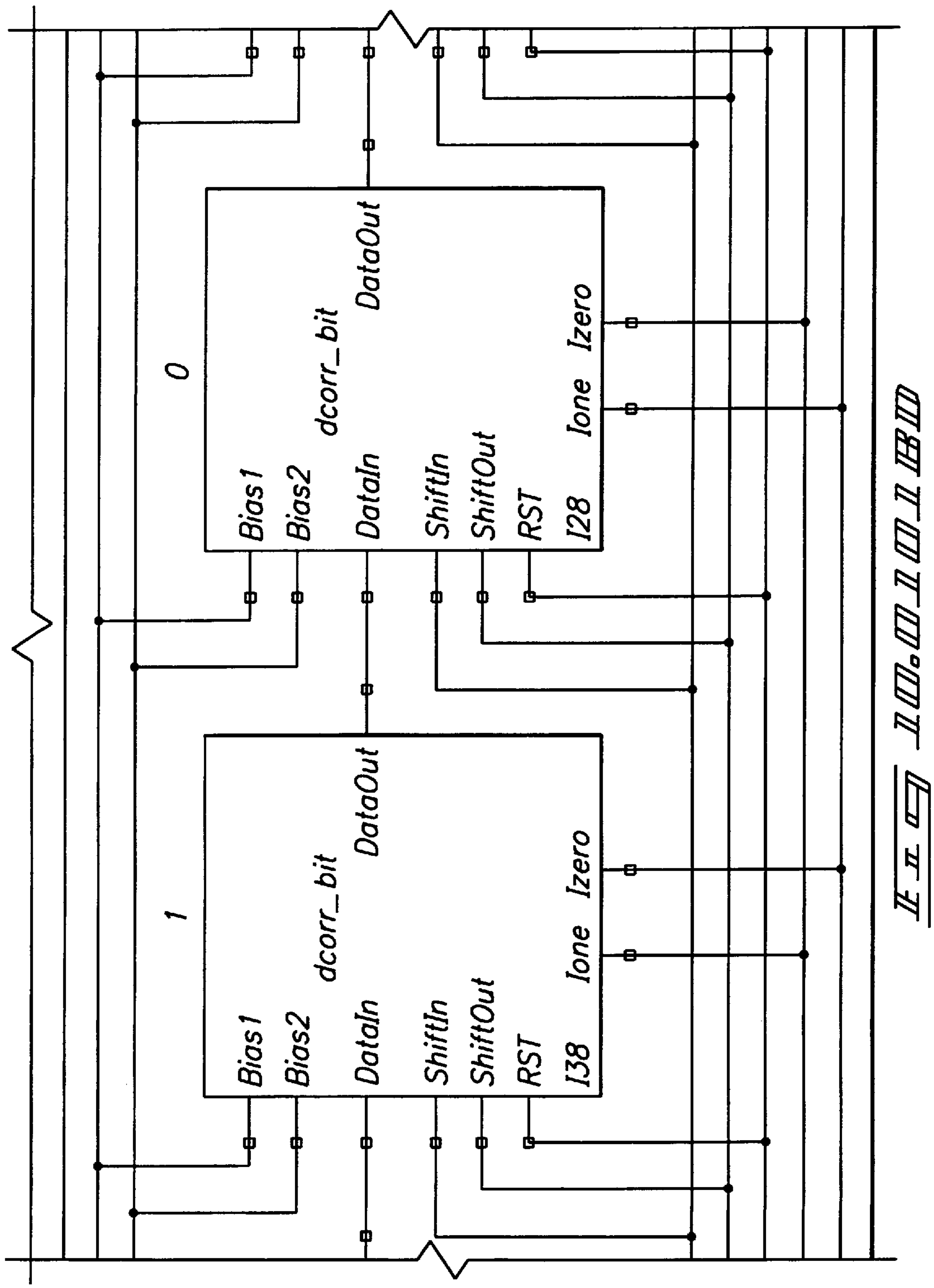
FIG_10.01.BD

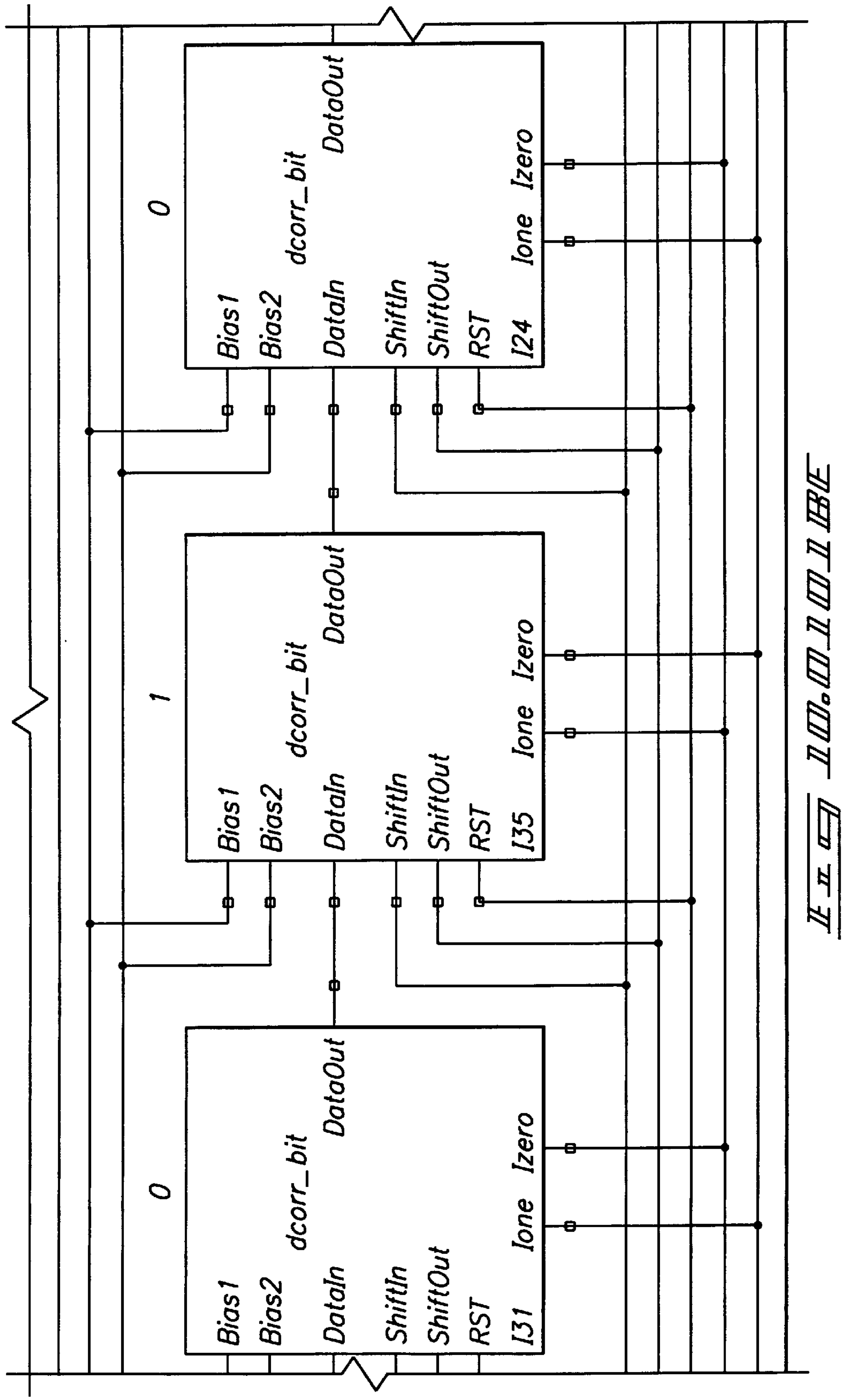
FIG. 10.011BE

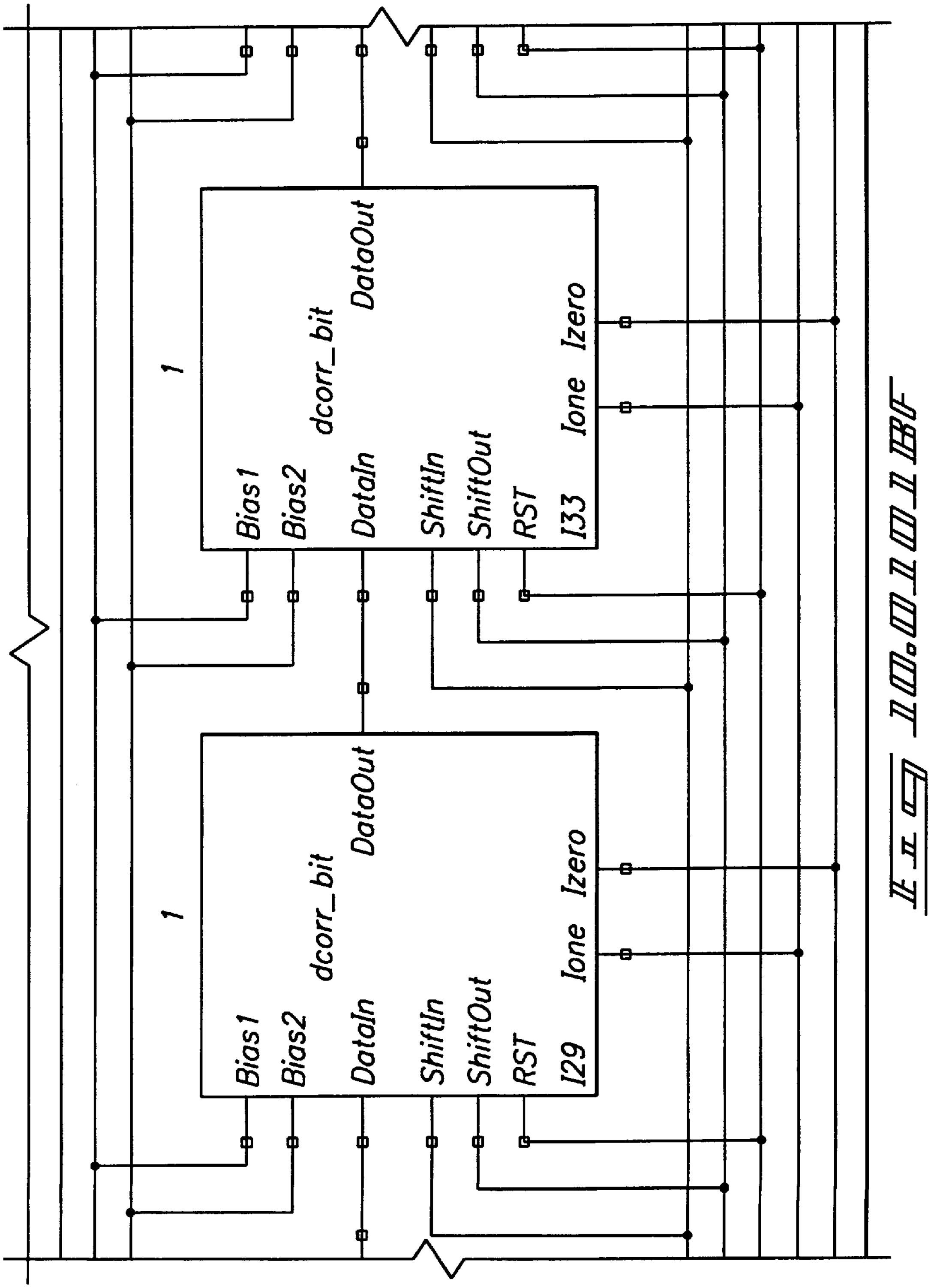
Fig_10.00.11BF

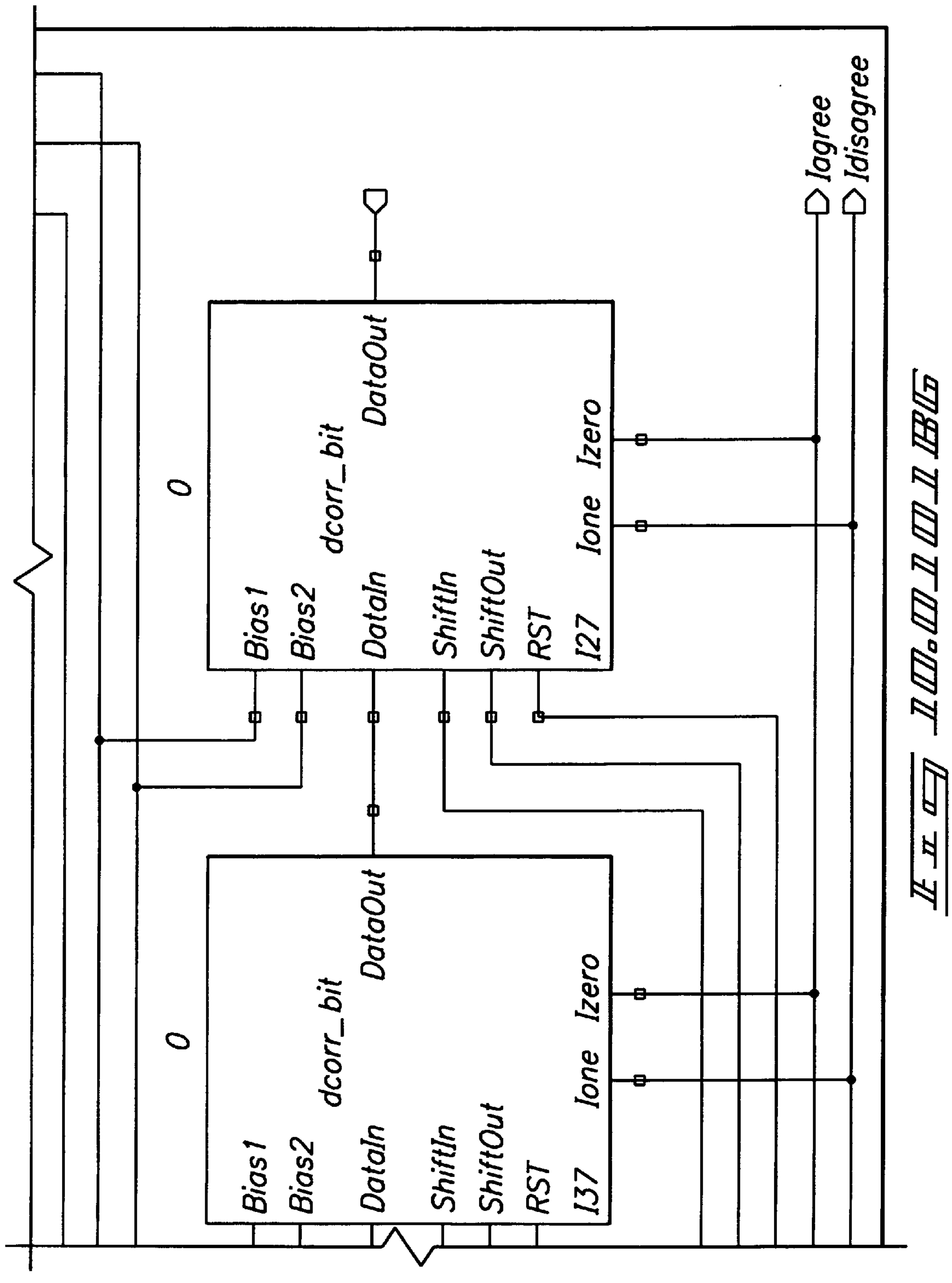
Fig. 10.0101BG

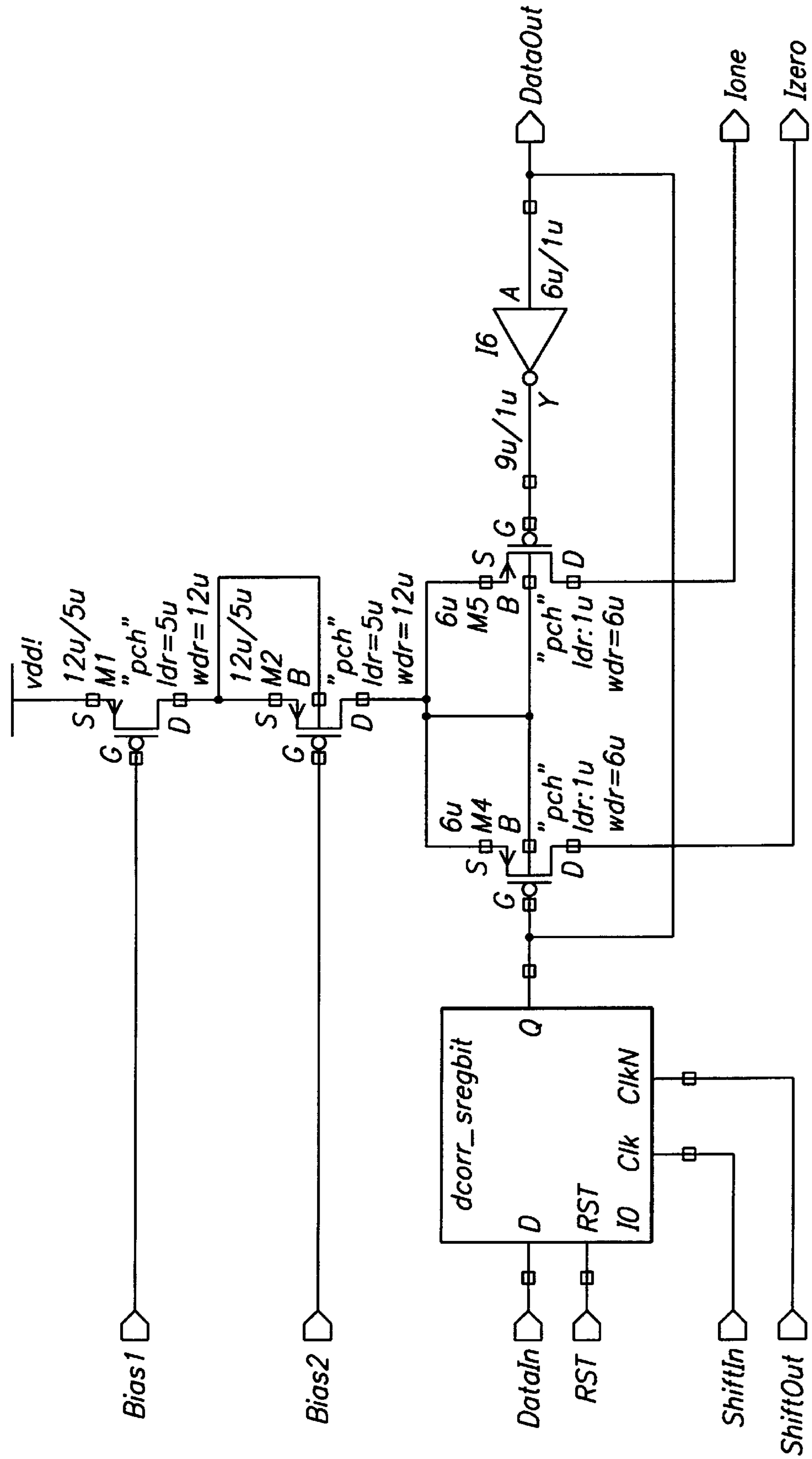
DataOut
Ione
Izero
I6
A
Y
6u/1u
9u/1u
vdd!
S
G
D
B
M1
M2
M4
M5
12u/5u
"pch"
ldr=5u
wdr=12u
6u
ldr:1u
wdr=6u
dcorr_sregbit
D
Q
RST
IO
Clk
ClkN
Bias1
Bias2
DataIn
RST
ShiftIn
ShiftOut

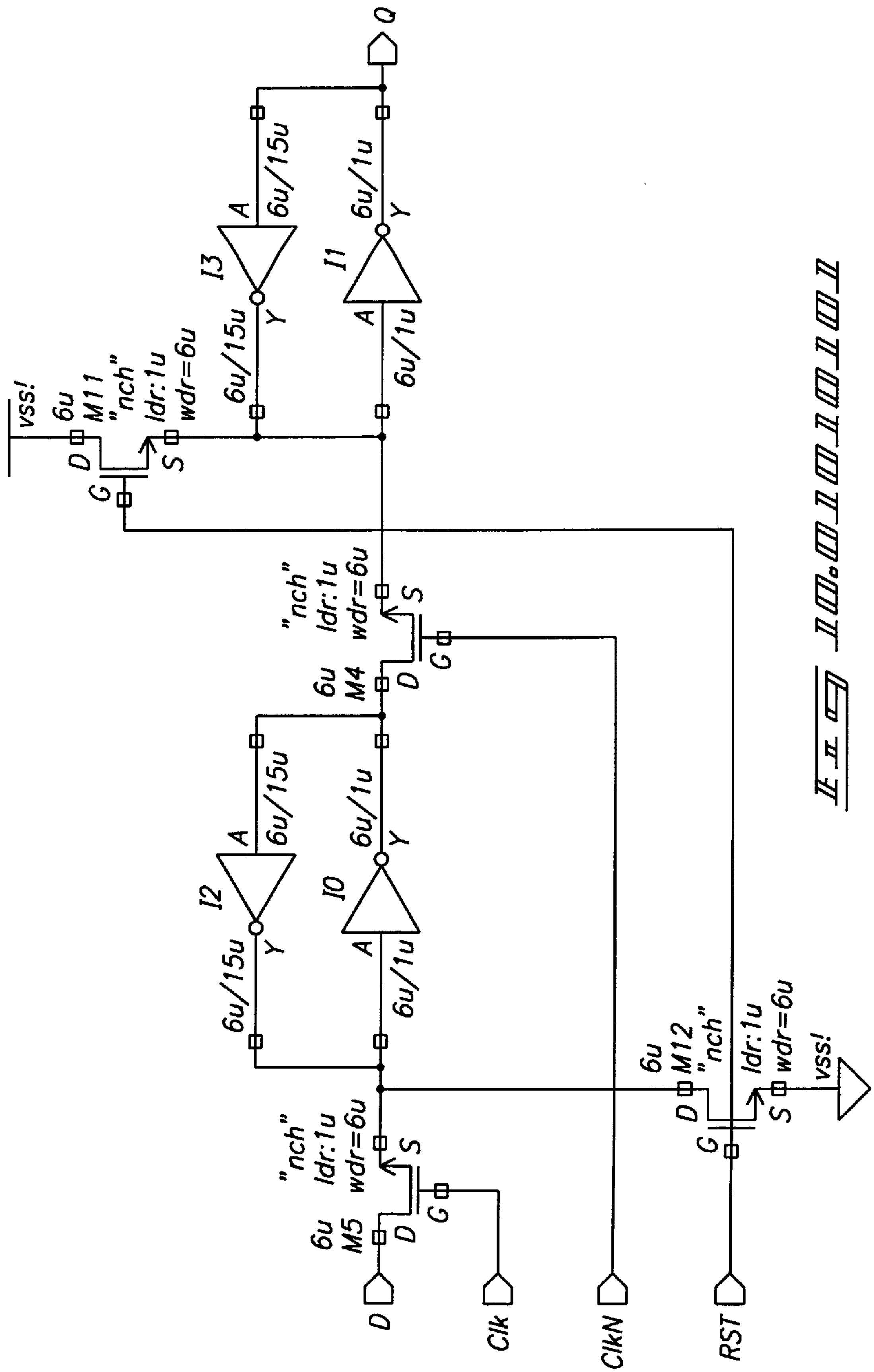
Q
6u/15u
6u/1u
A
Y
I3
I1
vss!
6u
M11
"nch"
ldr:1u
wdr=6u
D
G
S
M4
I2
I0
M5
M12
D
Clk
ClkN
RST

| | | | | | | | | | | | | | |
|---|---|---|---|---|---|---|---|---|---|---|---|---|---|
| 10.0102AA | 10.0102AB | 10.0102AC | 10.0102AD | 10.0102AE | 10.0102AF | 10.0102AG | 10.0102AH | 10.0101AI | 10.0102AJ | 10.0102AK | 10.0102AL | 10.0102AM | 10.0102AN |
| 10.0102BA | 10.0102BB | 10.0102BC | 10.0102BD | 10.0102BE | 10.0102BF | 10.0102BG | 10.0102BH | 10.0101AI | 10.0102BJ | 10.0102BK | 10.0102BL | 10.0102BM | 10.0102BN |
| | | | | | | | | | 10.0102CJ | 10.0102CK | 10.0102CL | 10.0102CM | 10.0102CN |

FIG. 10.0102

Fig. 10.0102AA
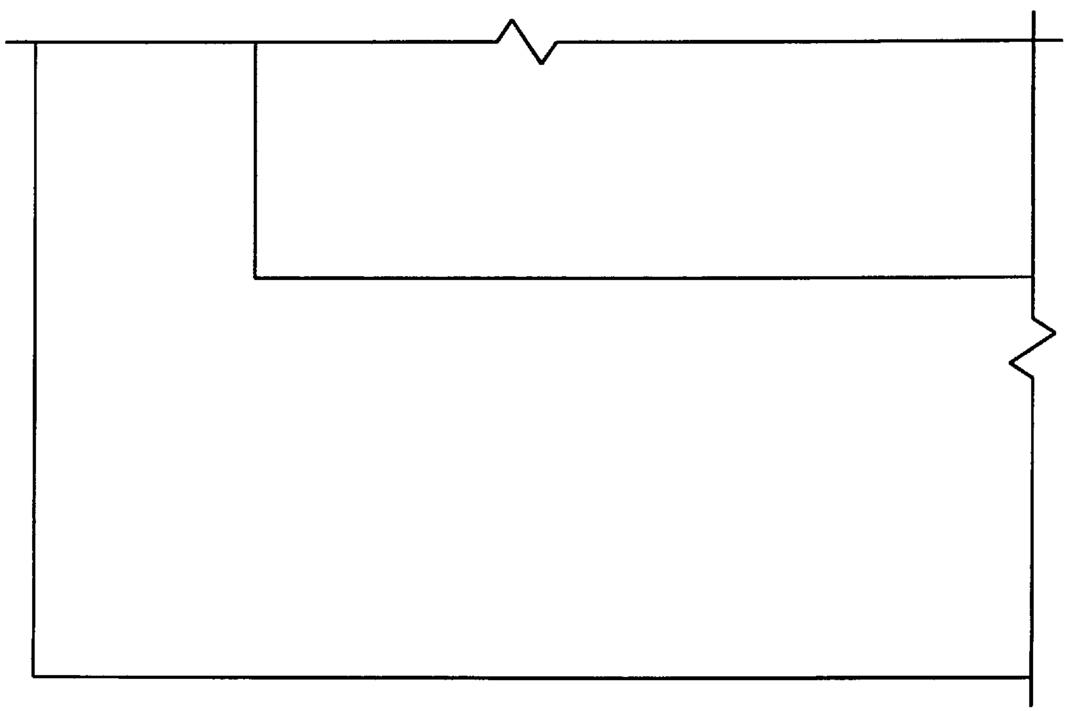

FIG. 10.0102AB
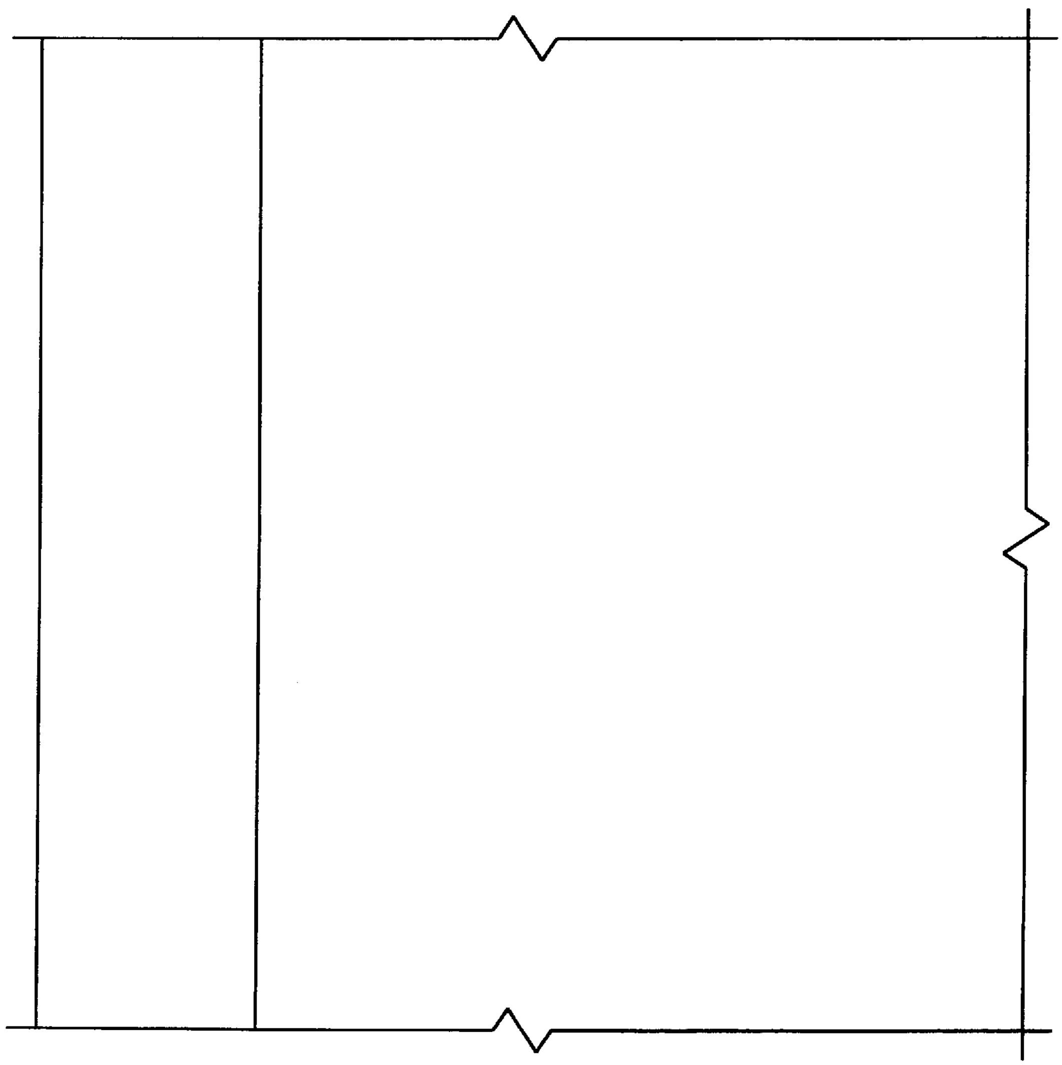

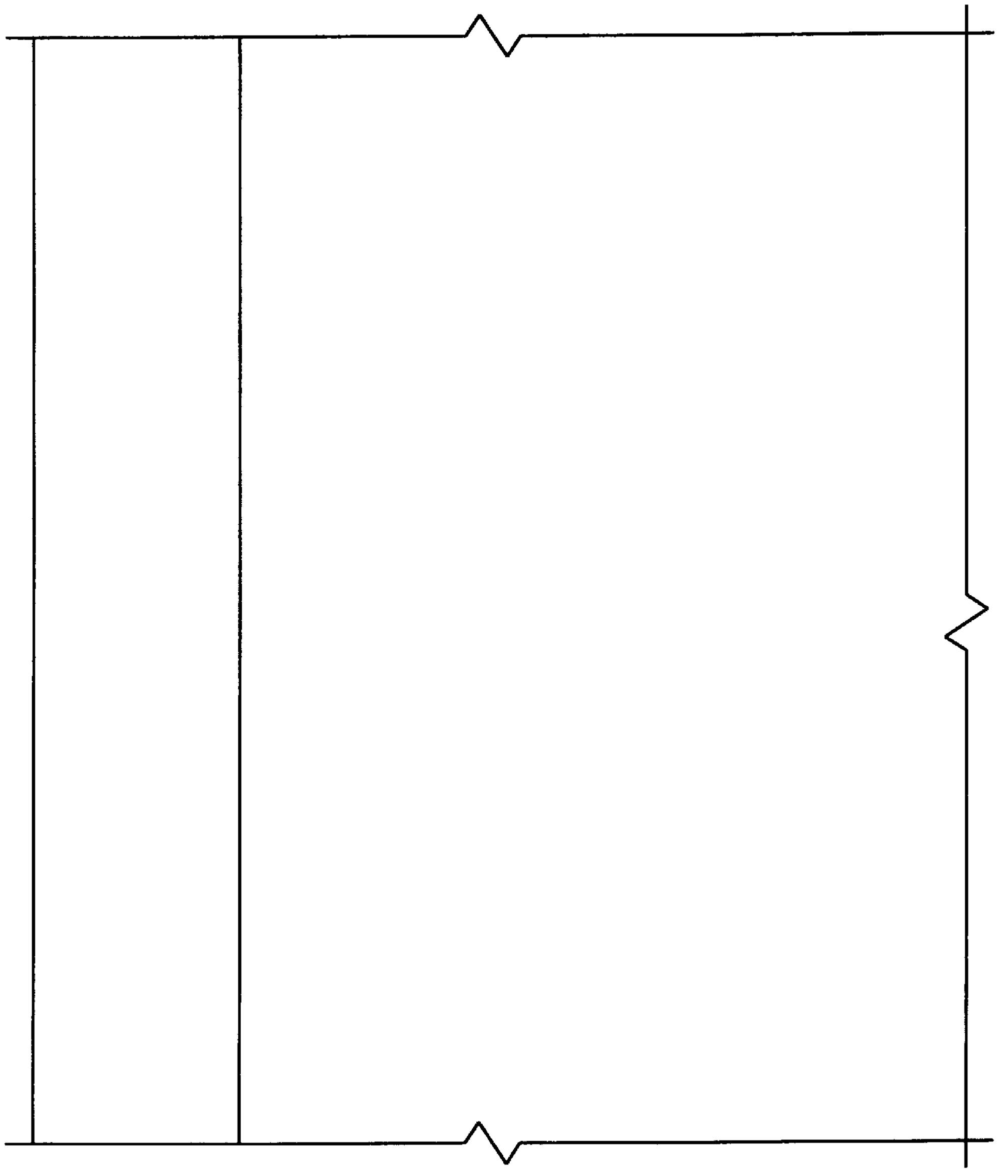
Fig. 10.0102AC

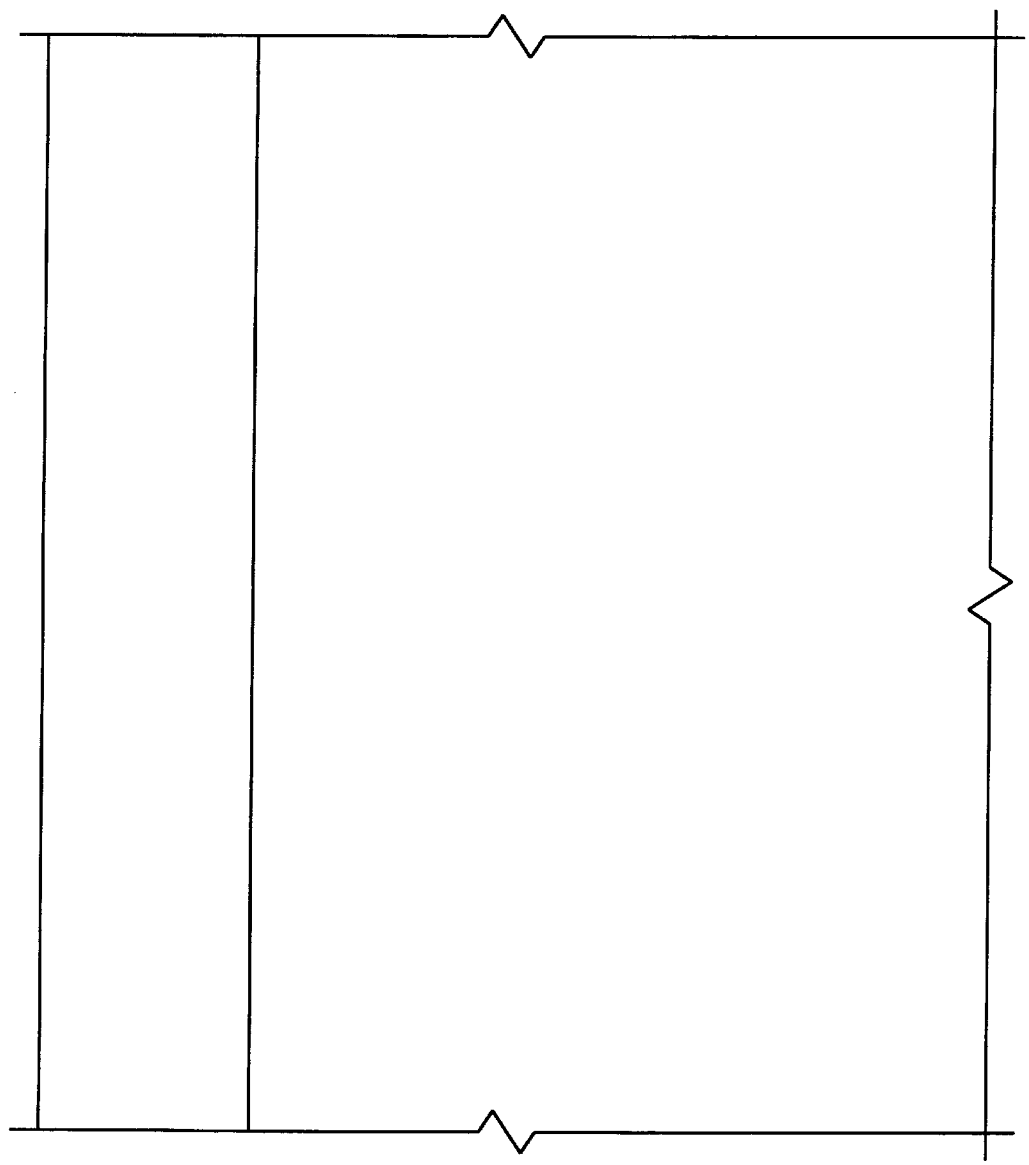
Fig 10.0102AD

Fig. 10.010.2AE
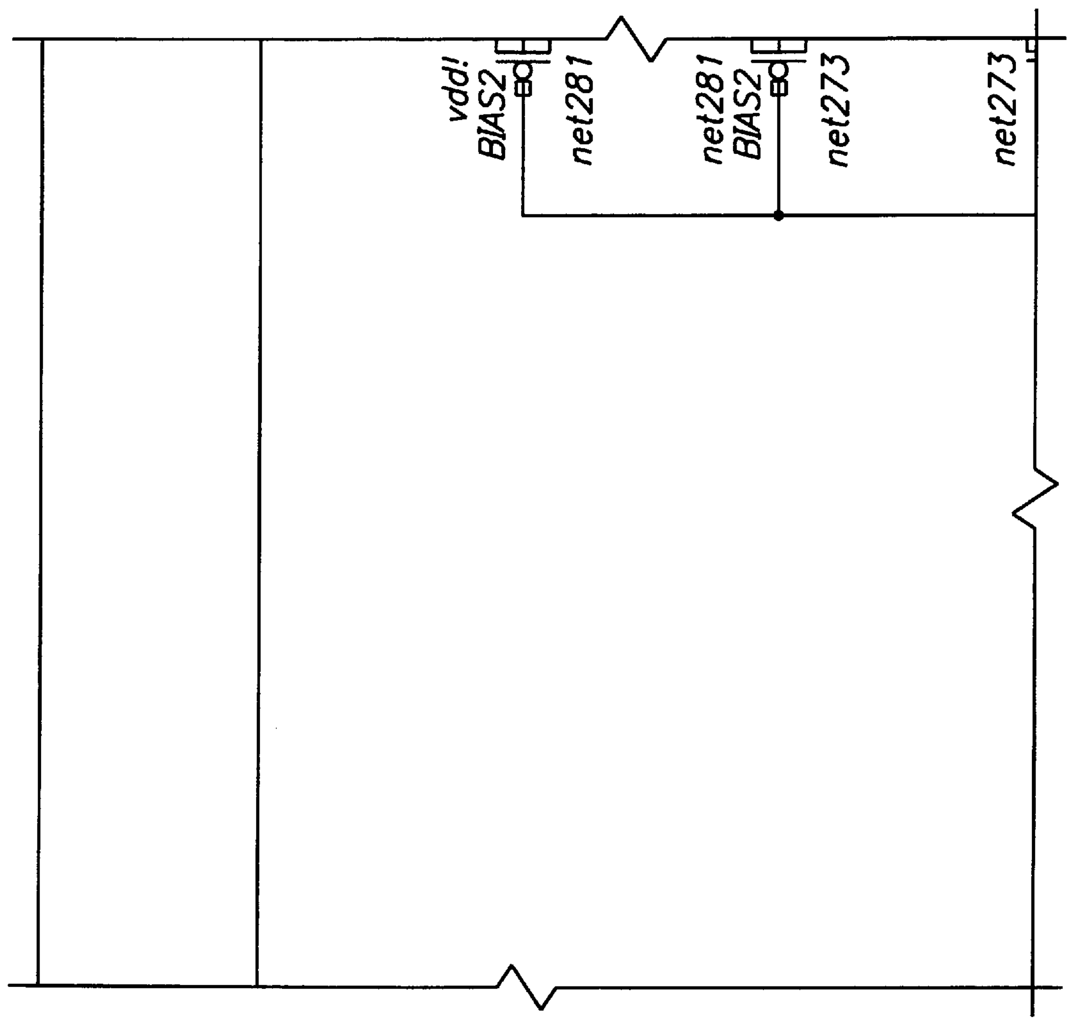

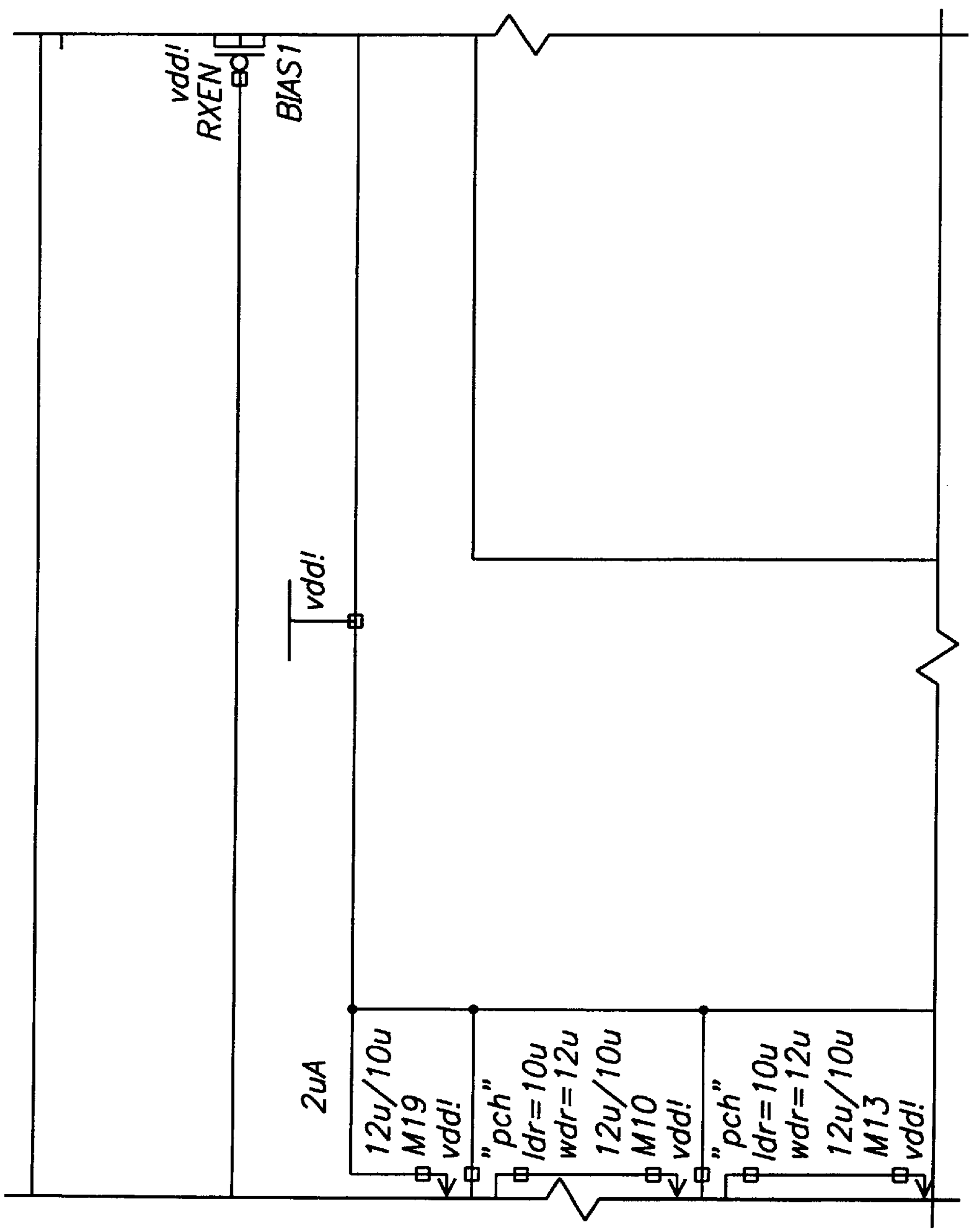
FIG. 110.01102AF

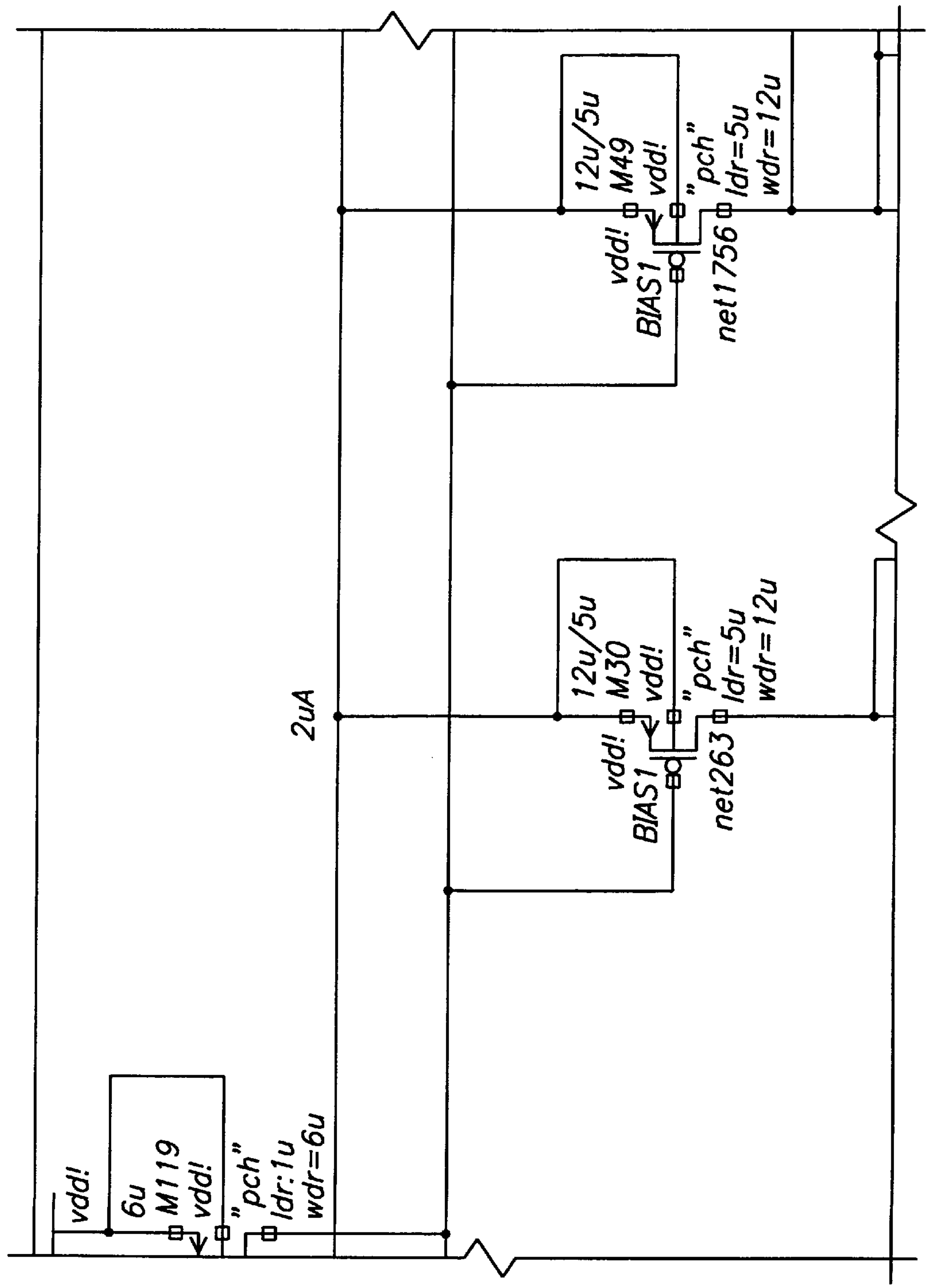
Fig 10.010.2AG

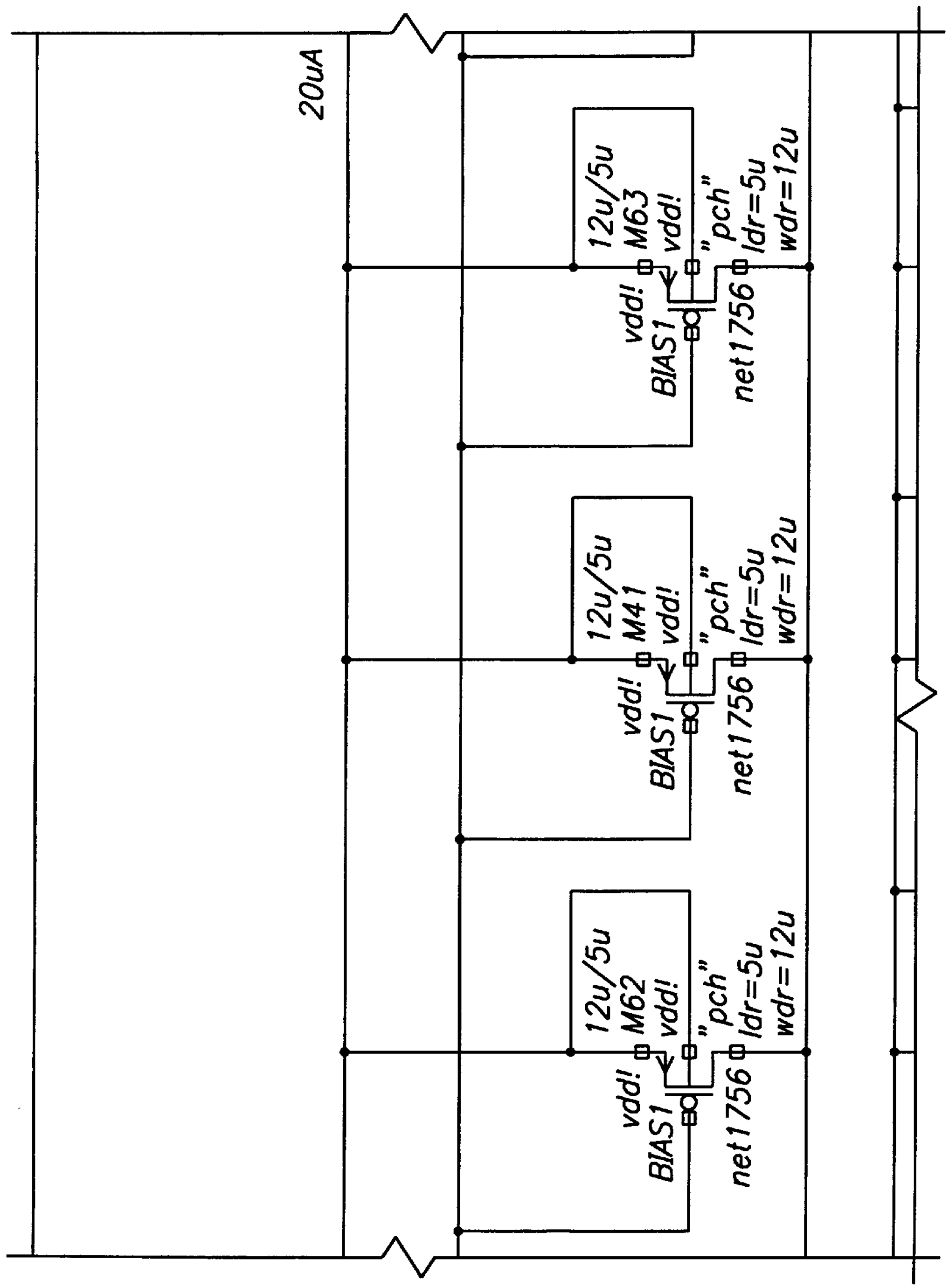
Fig. 10.0102AH

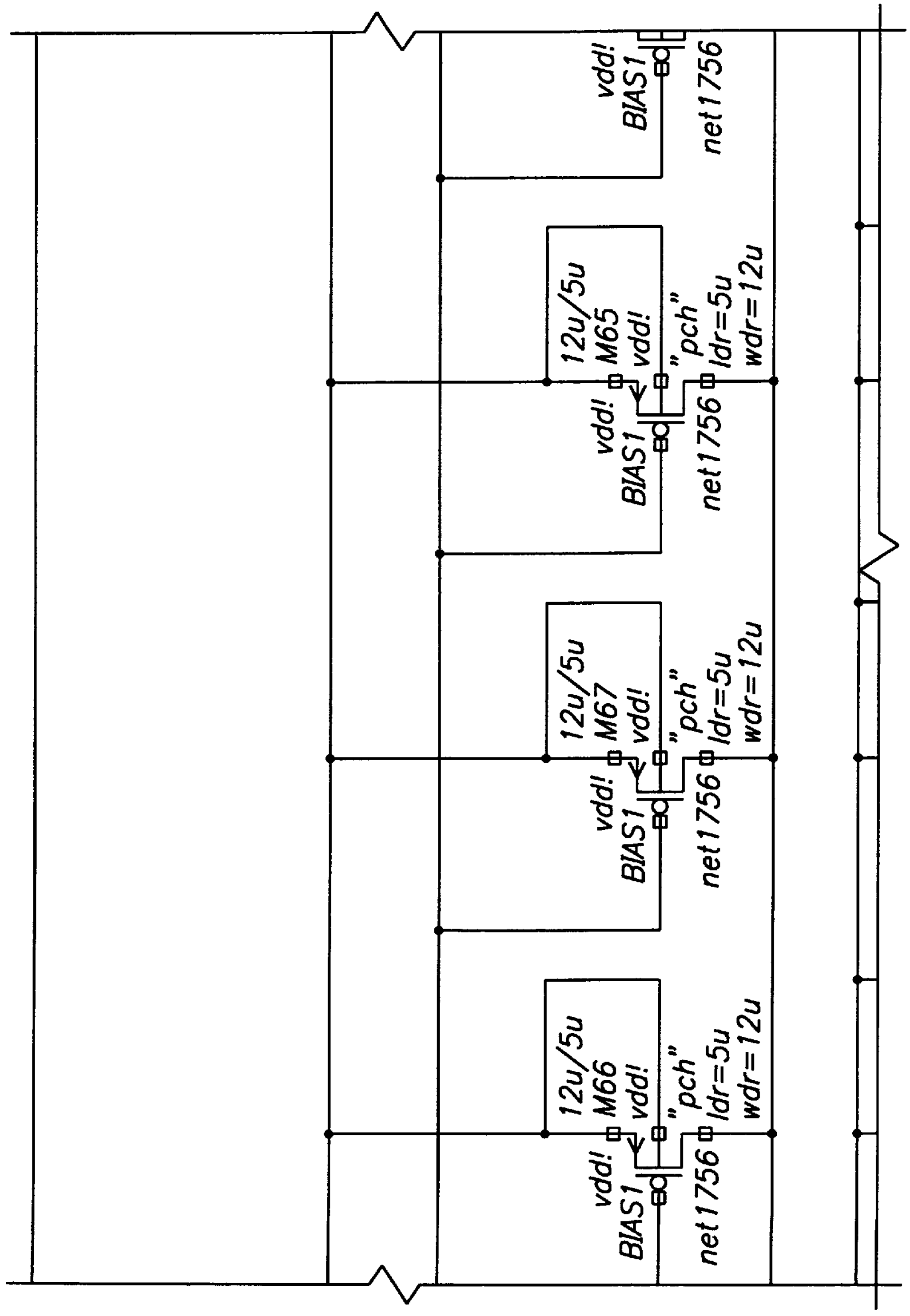
FIG. 10.010.2AI

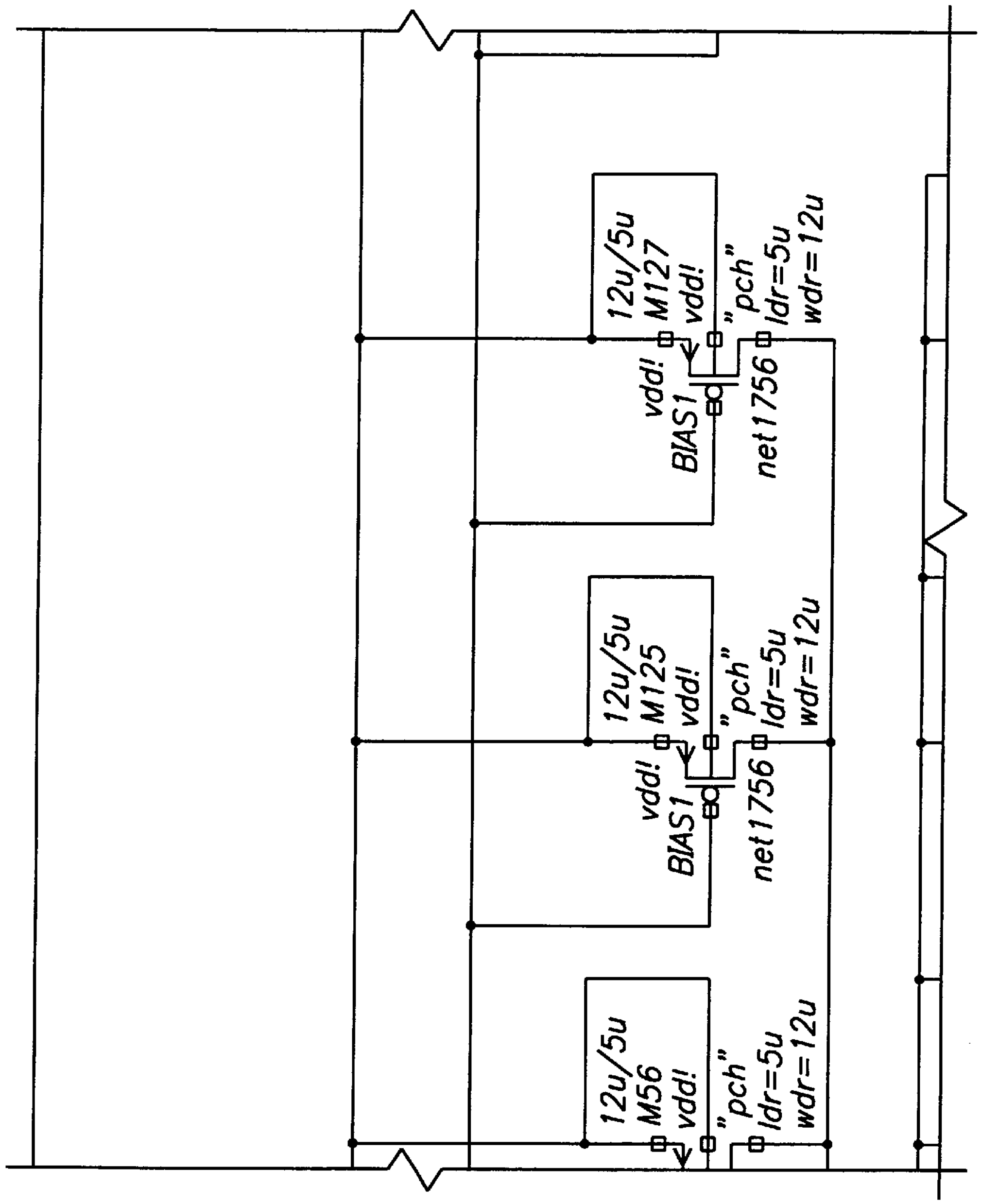
Fig 10.010ZAJ

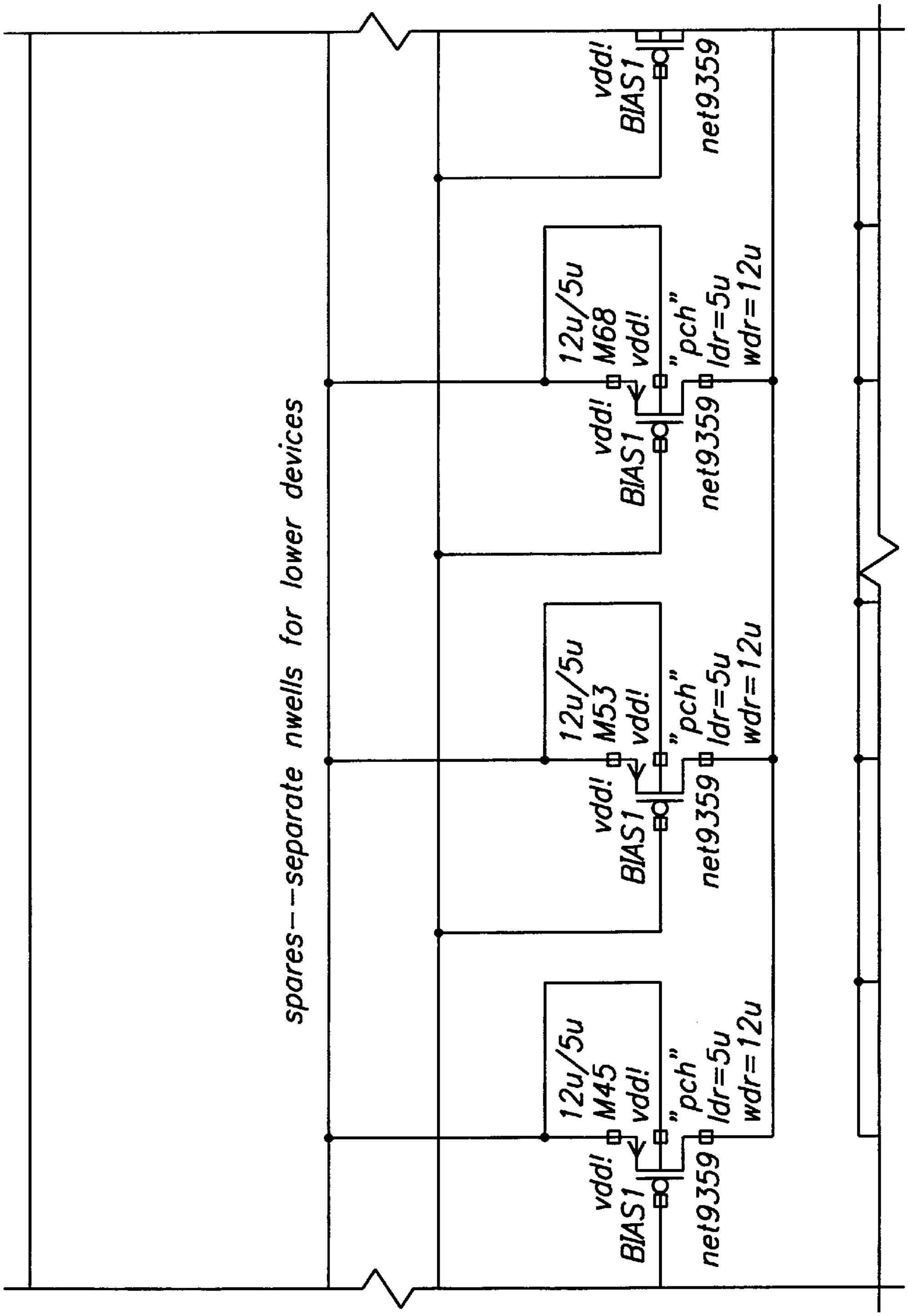
FIG. 100.100.2AK

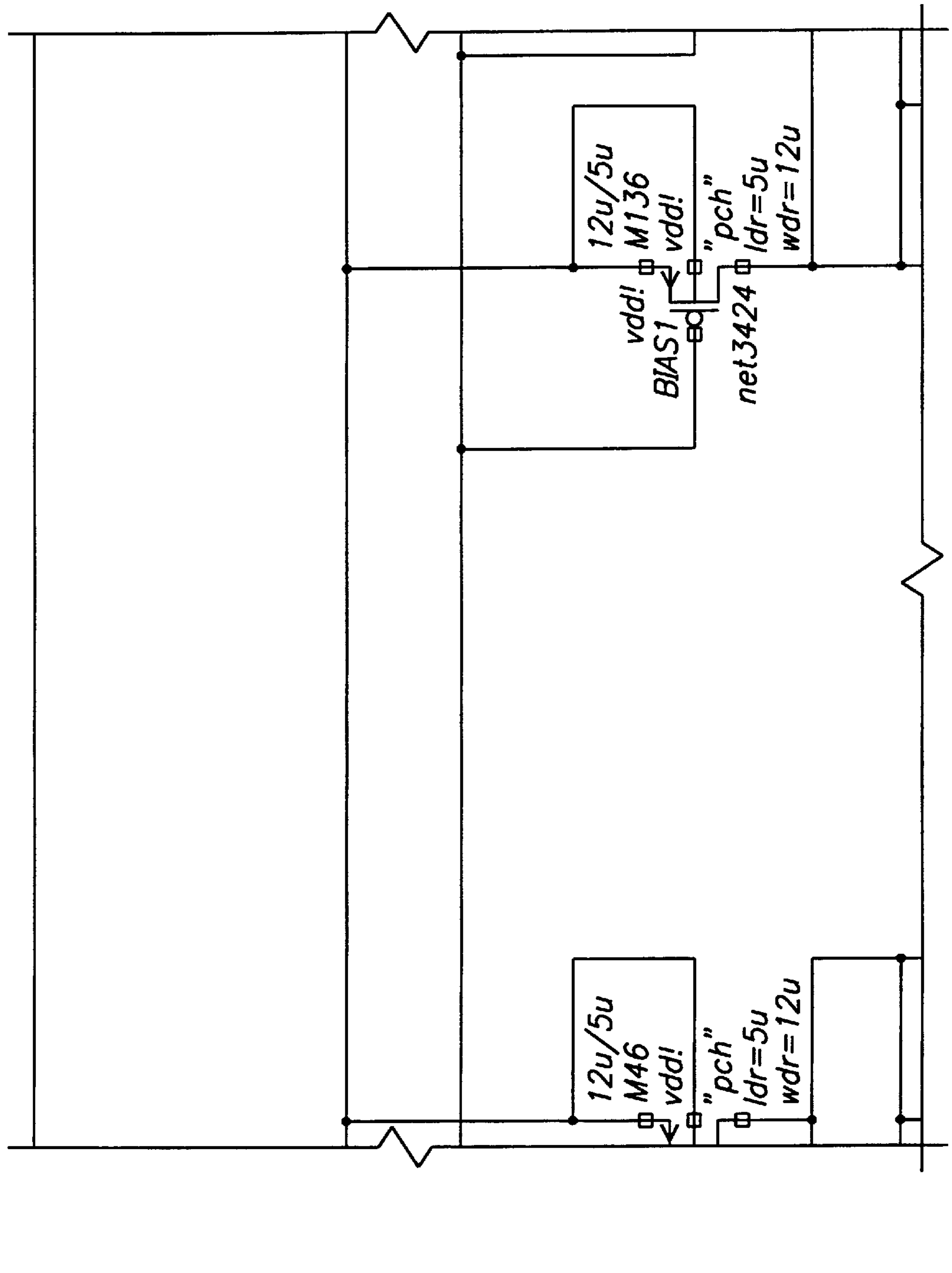
FIG. 10.010.2AL

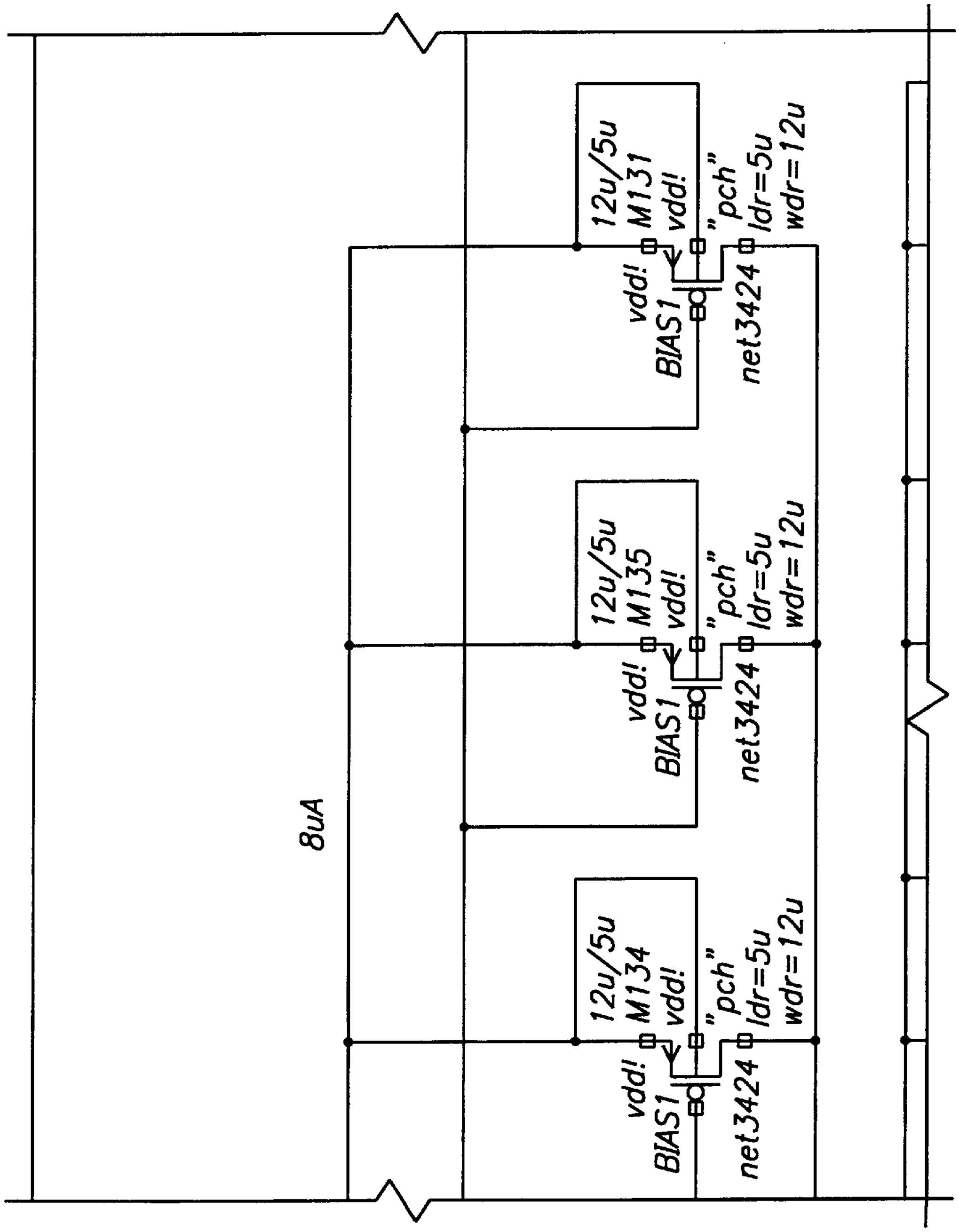
Fig. 10.010.2AM

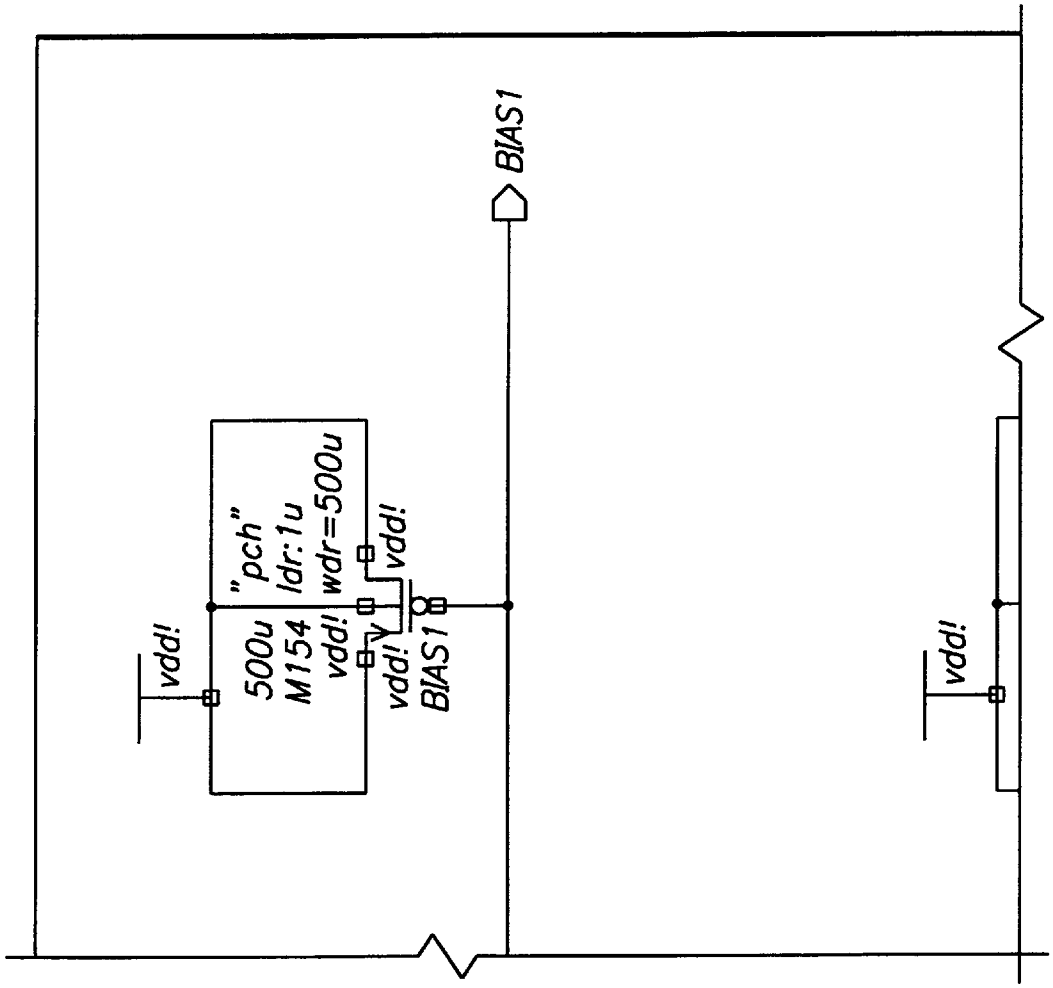
FIG 10.010ZAN

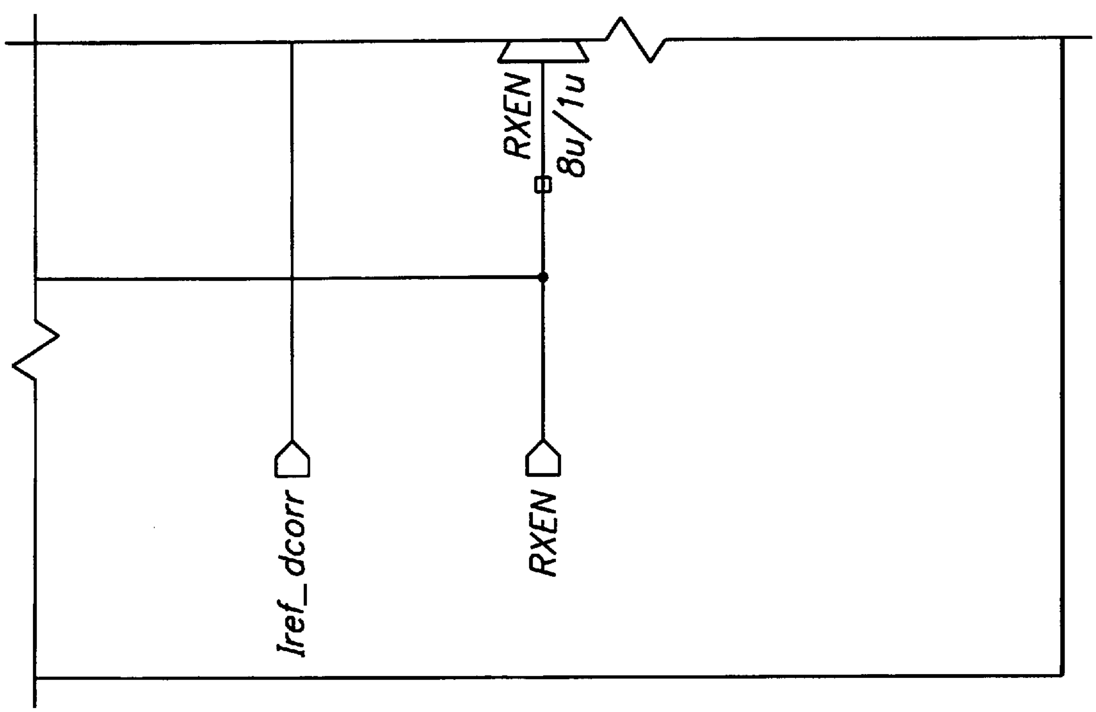
Fig 10.0102BA

Fig. 10.0102BB
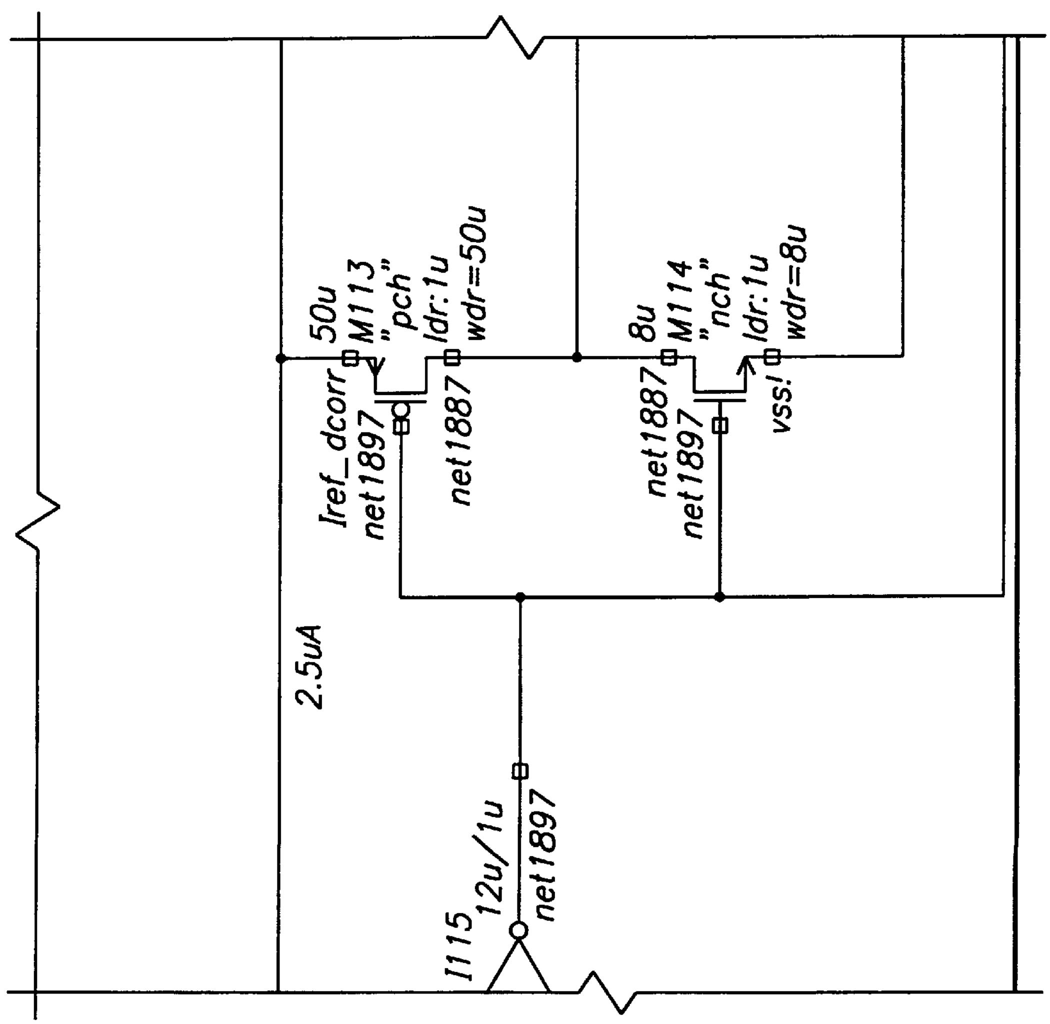

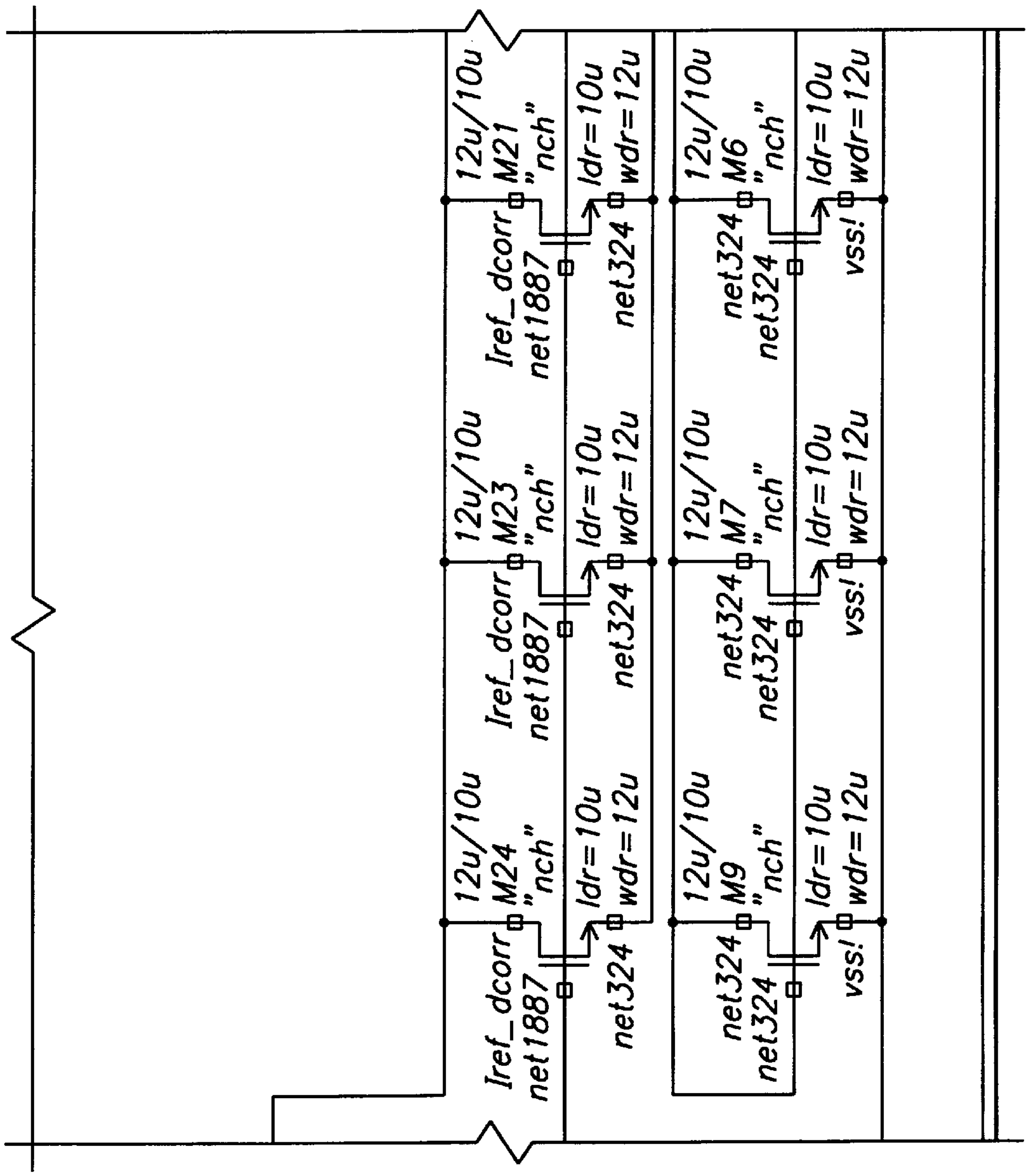
FIG. 10.010.2BC

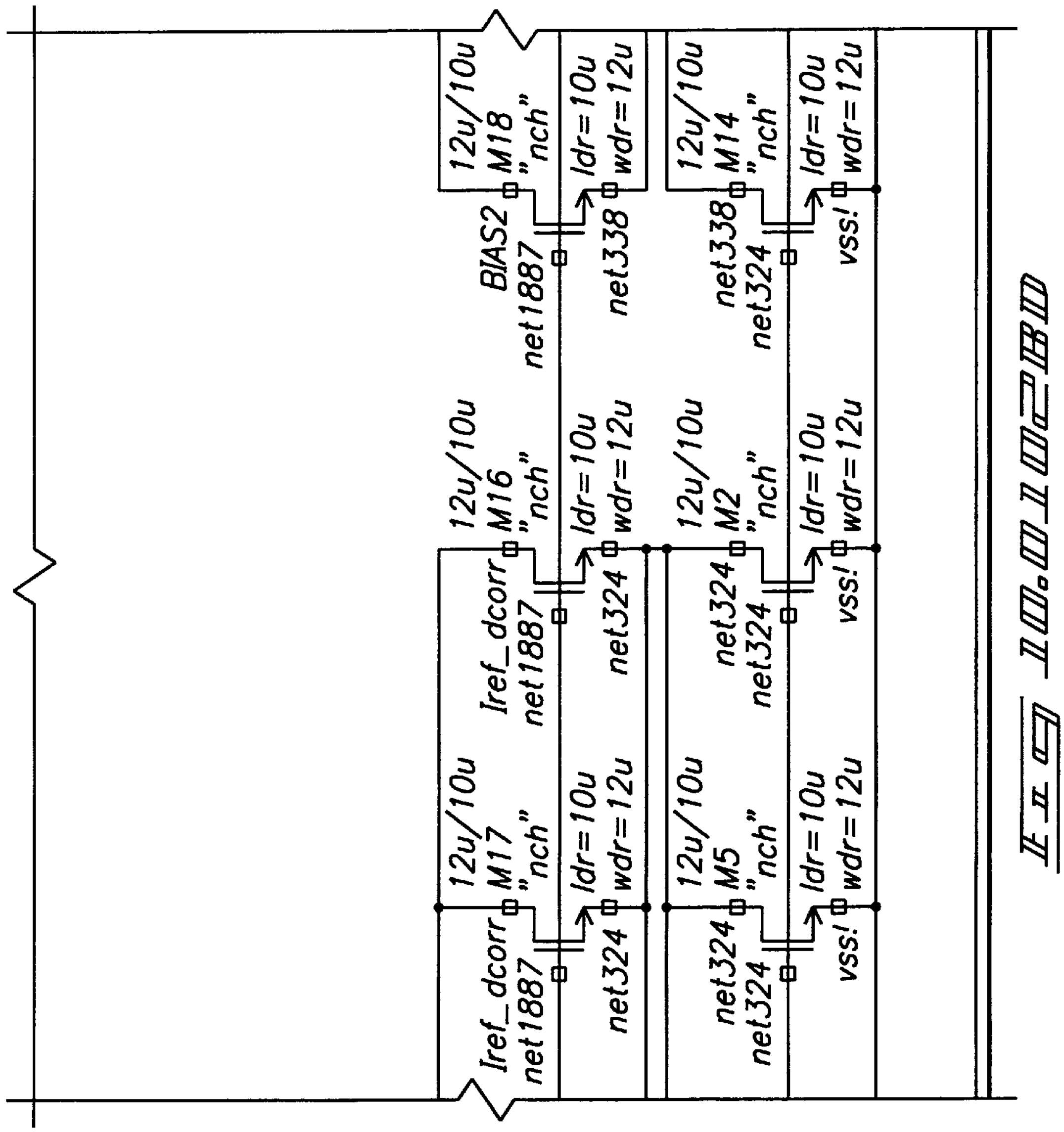
FIG. 10.102BD

Fig 10.0102BE
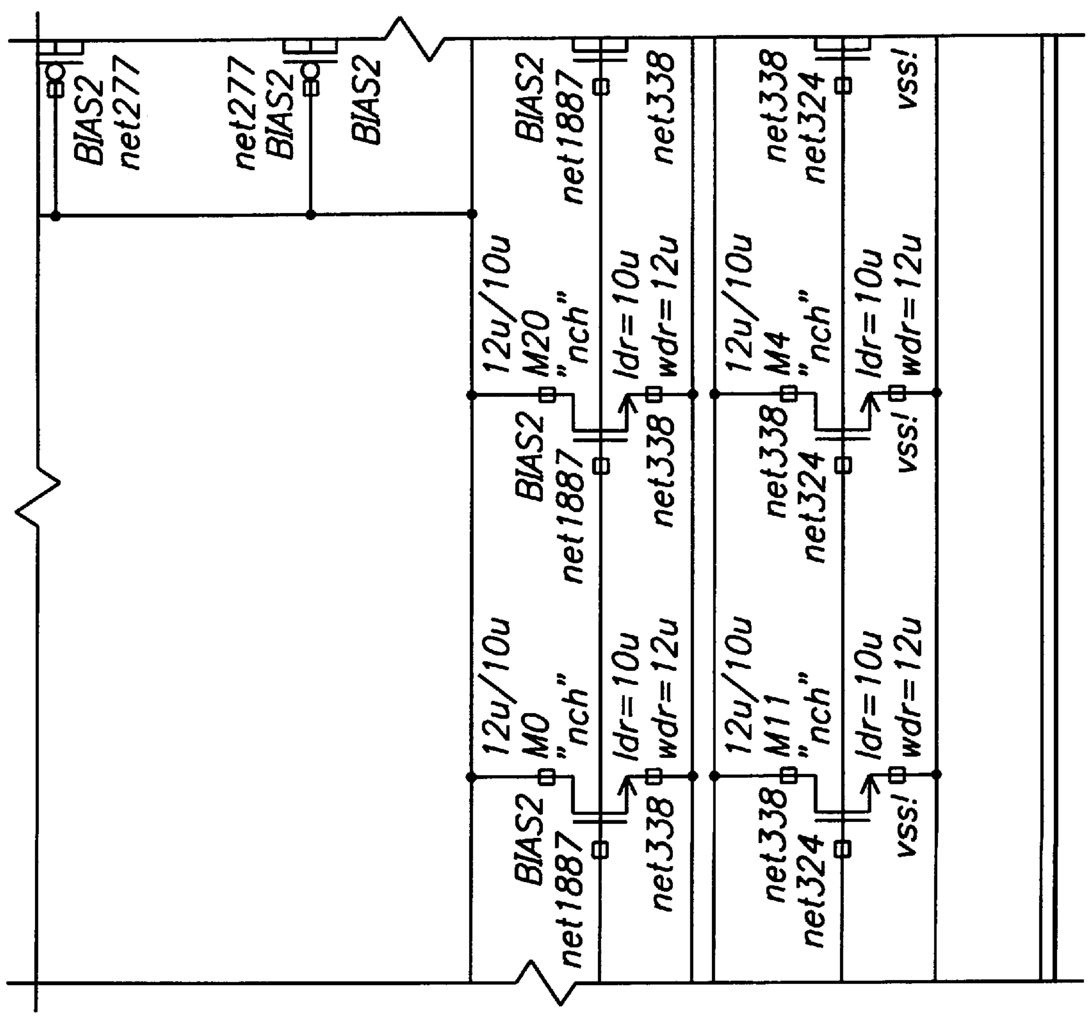

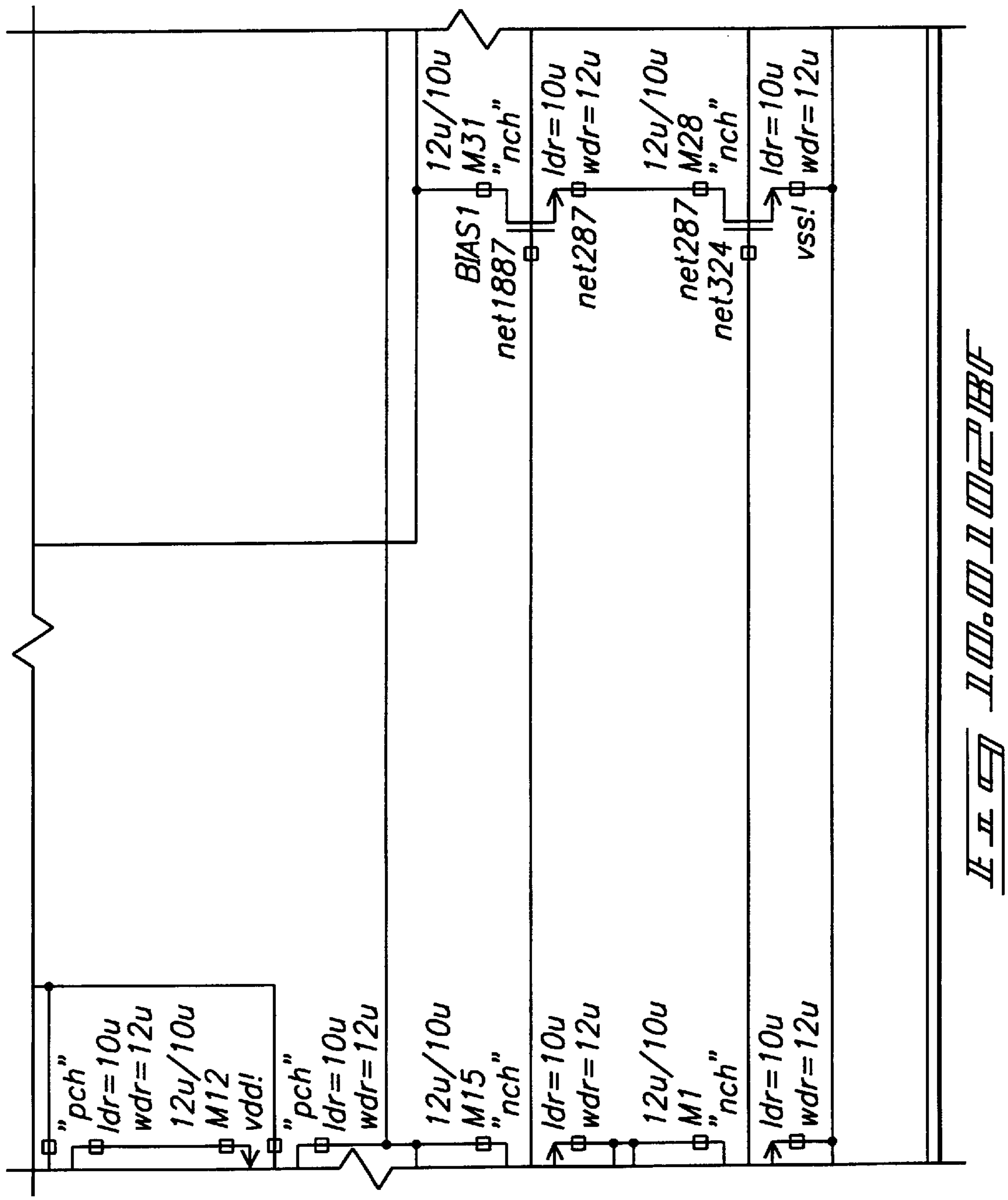
Fig. 10.0102BF

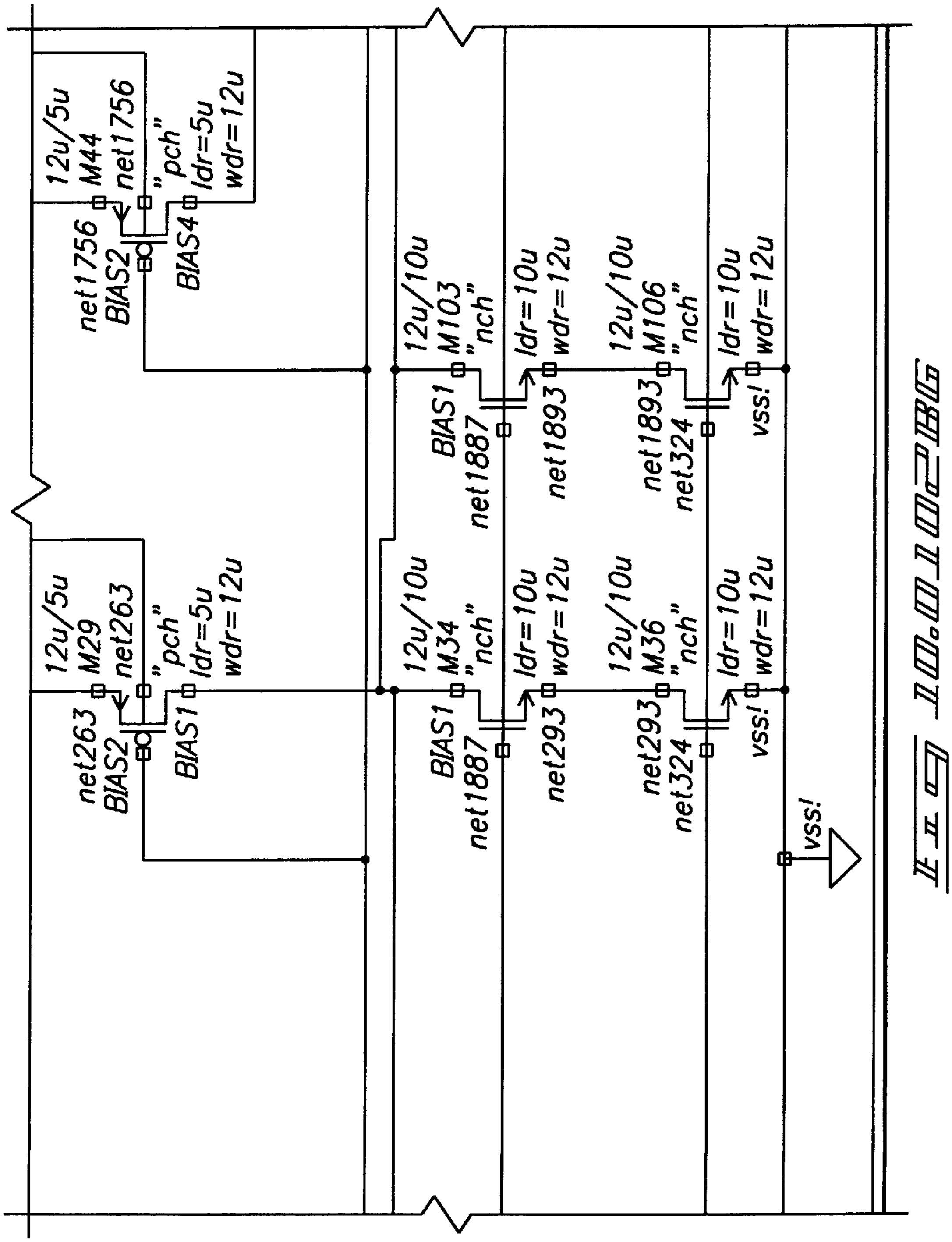
FIG. 10.10.2BG

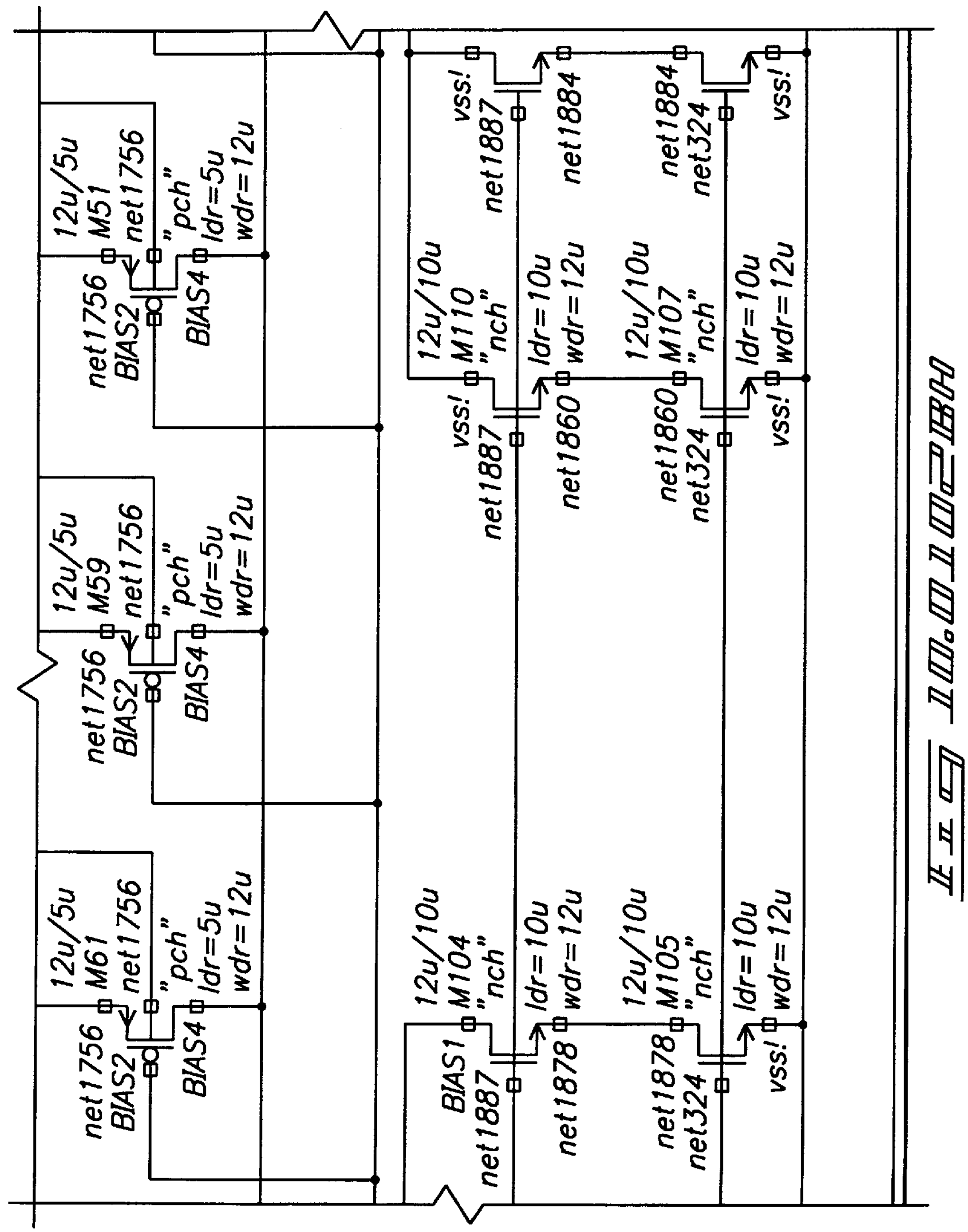
FIG 100.0102BH

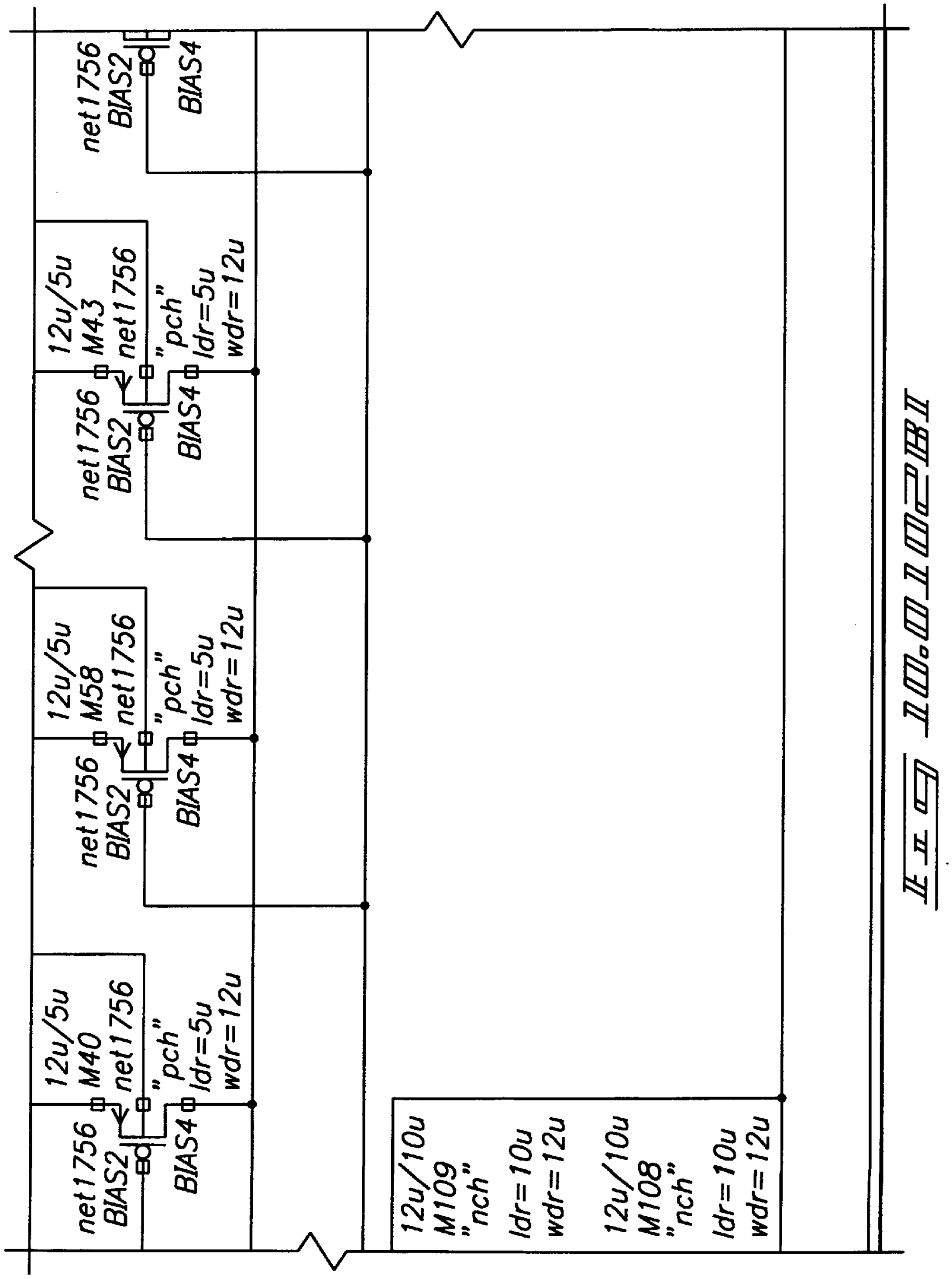
Fig 10.010.2BI

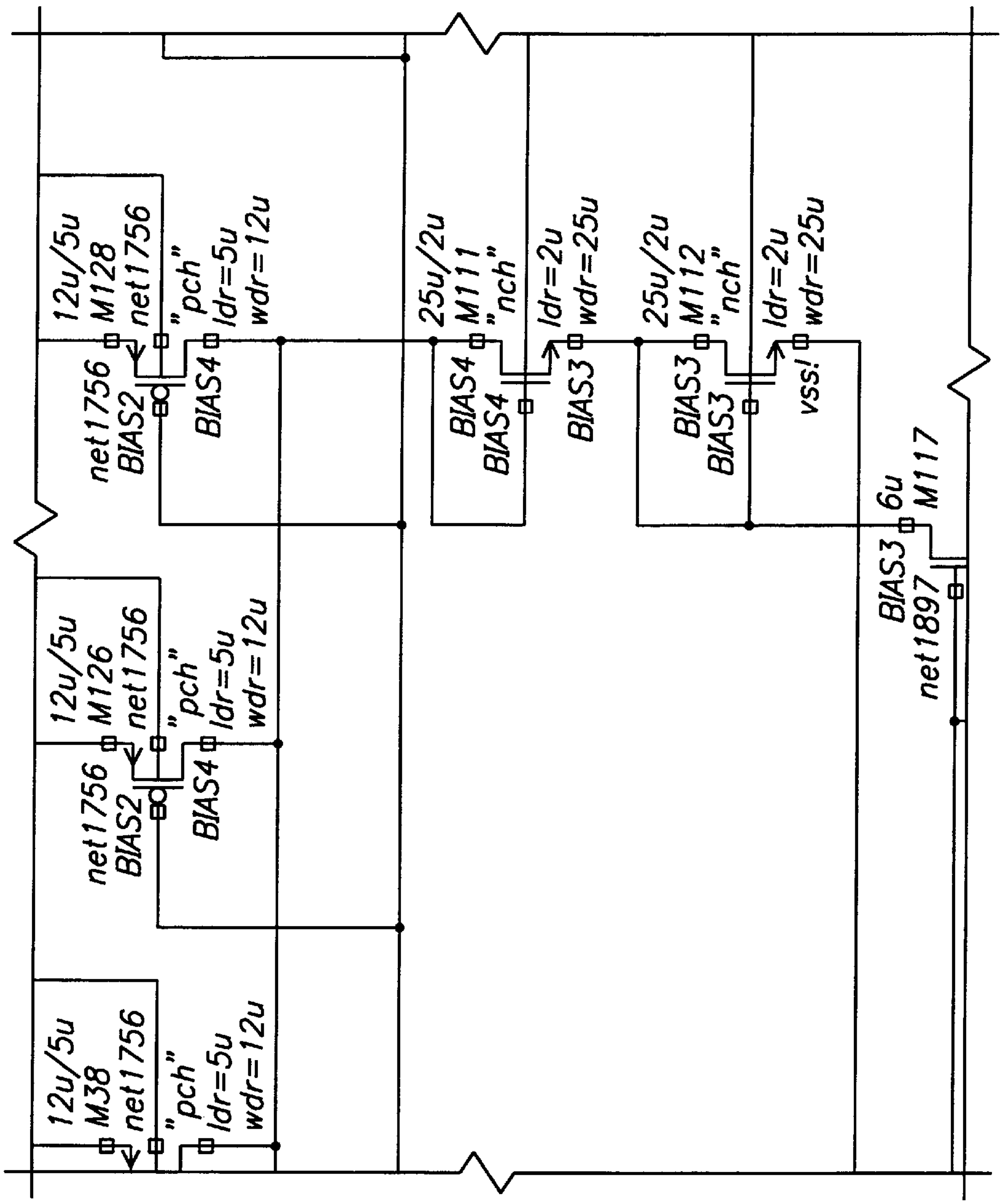
Fig. 10.010.2Bd

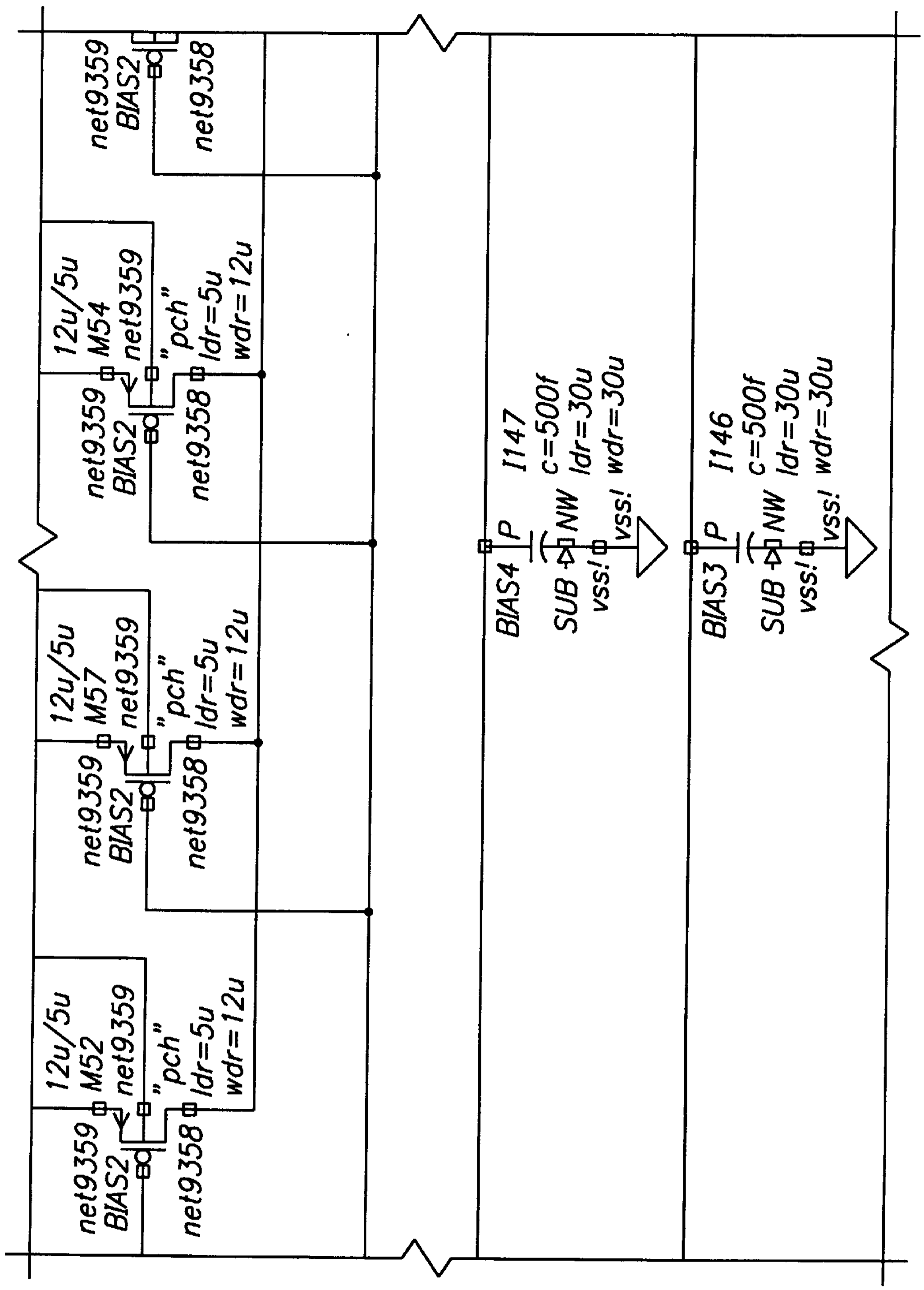
FIG 10.010.2BK

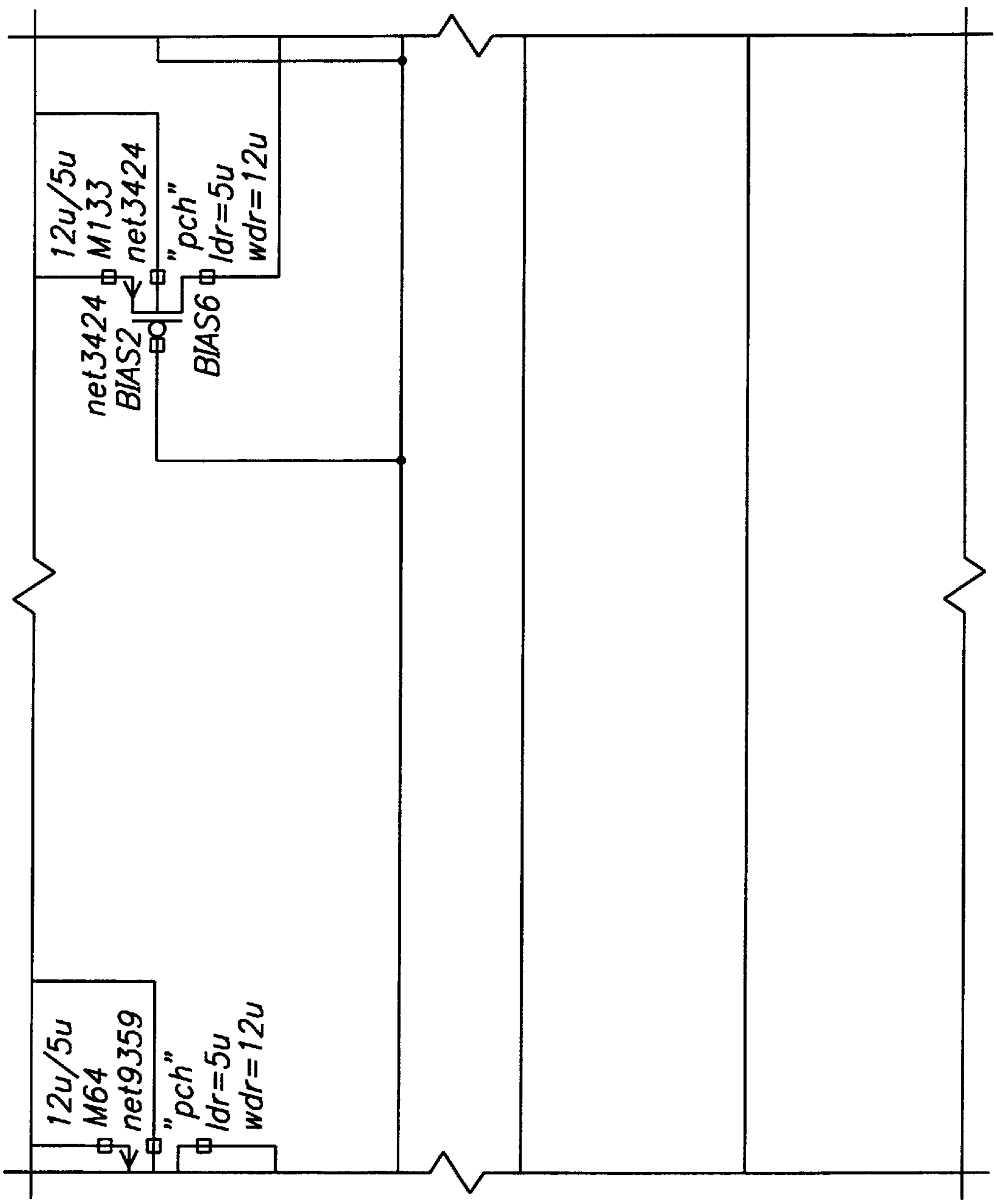
Fig. 10.010.2BL

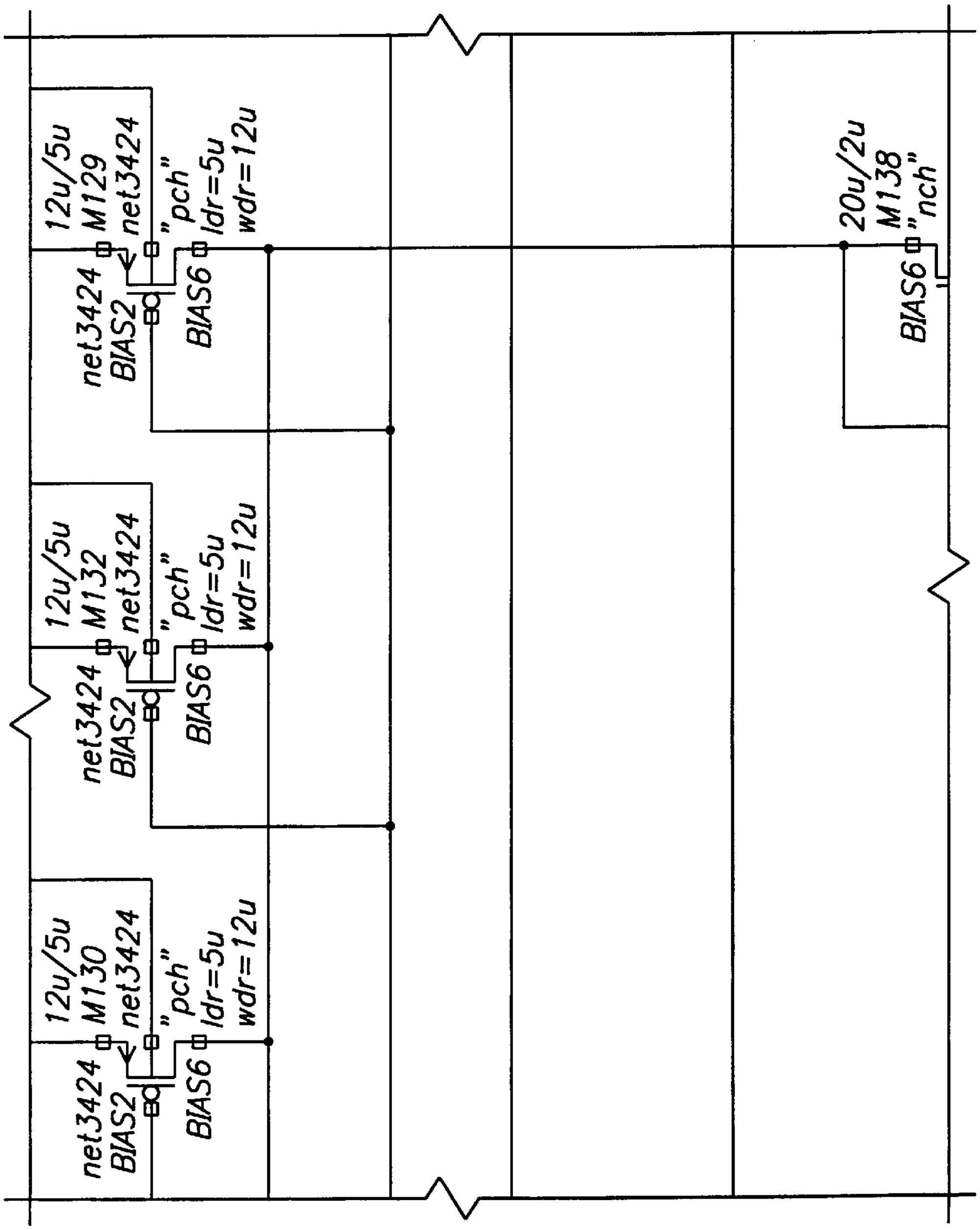
Fig. 10.010.2BM

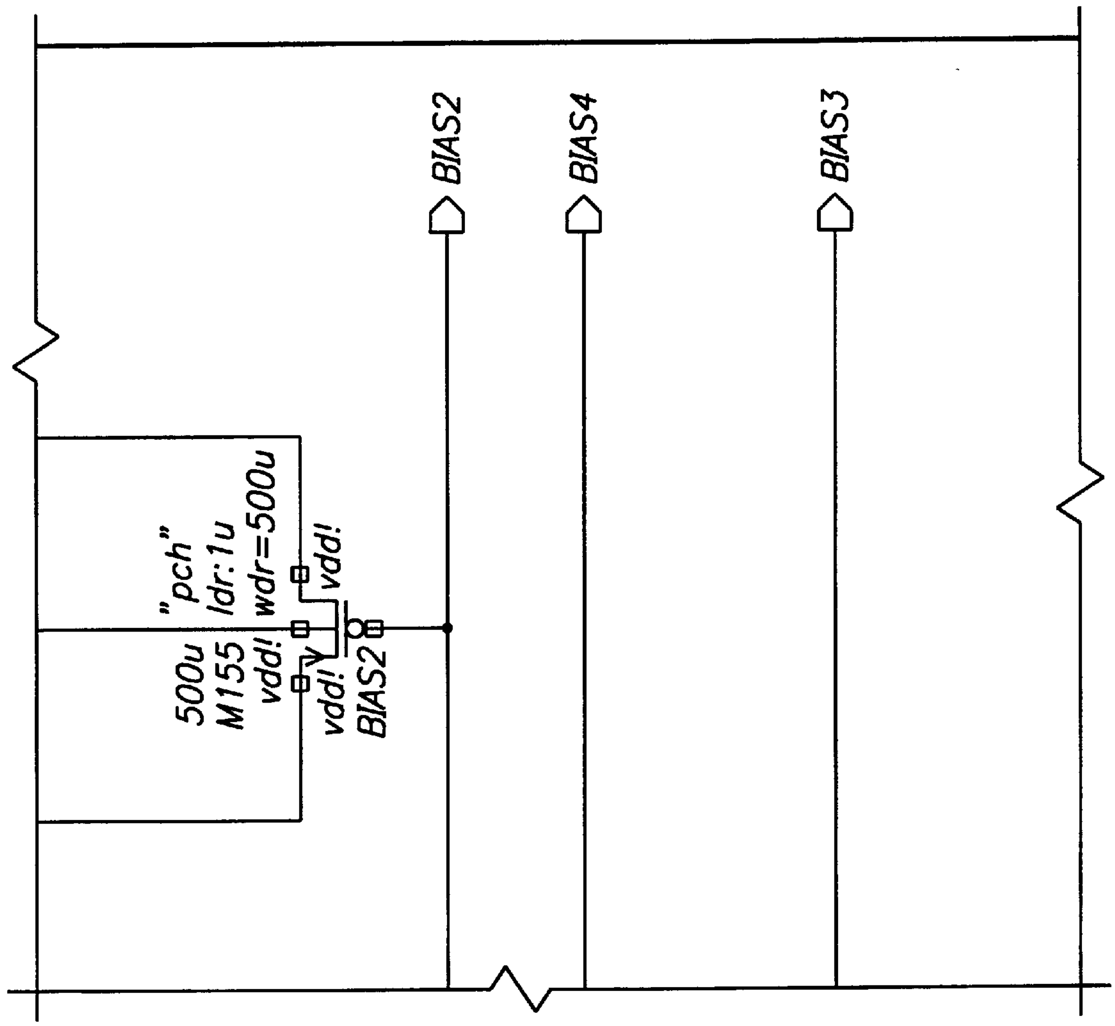
FIG. 10.0102BN

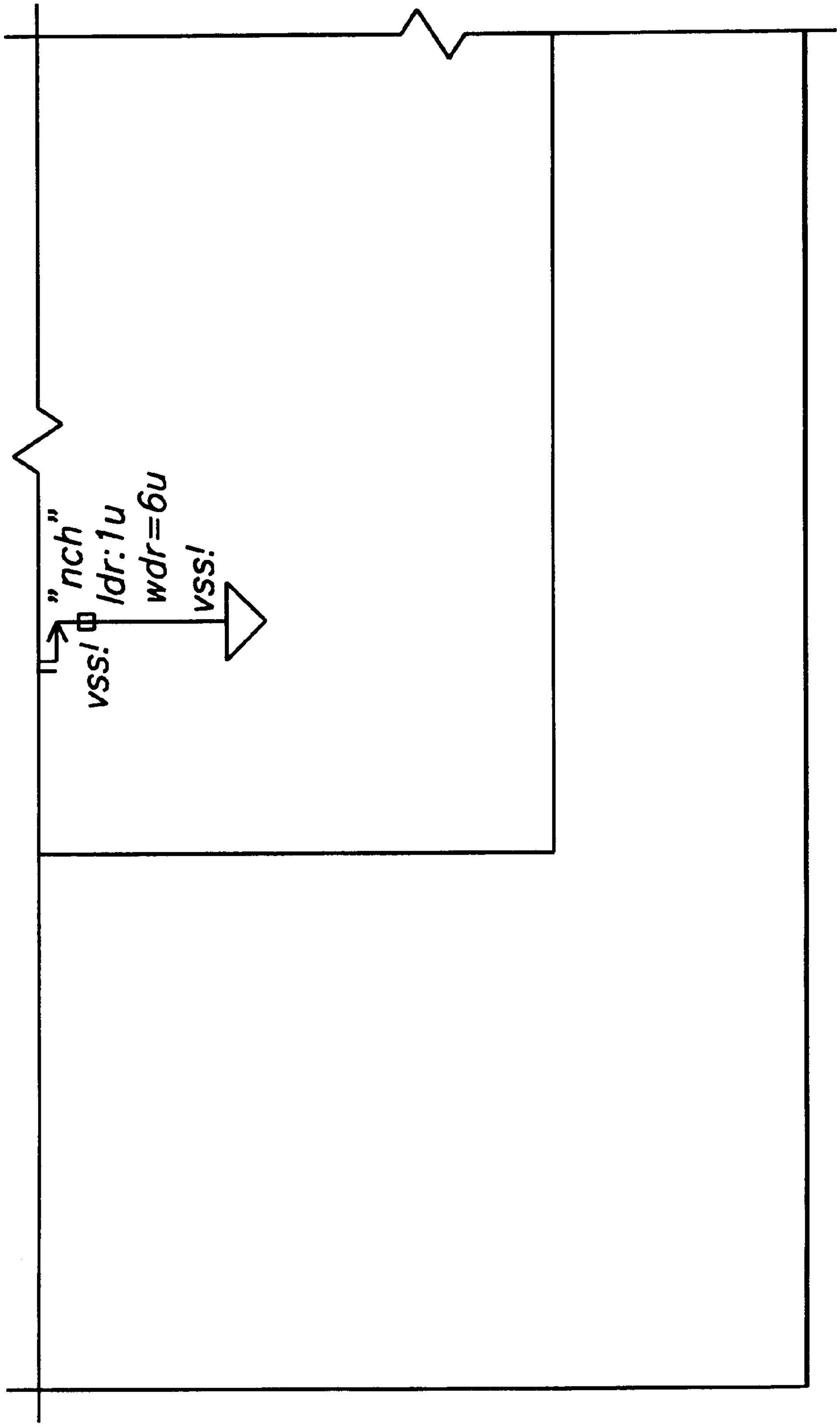
Fig. 10.102C.J

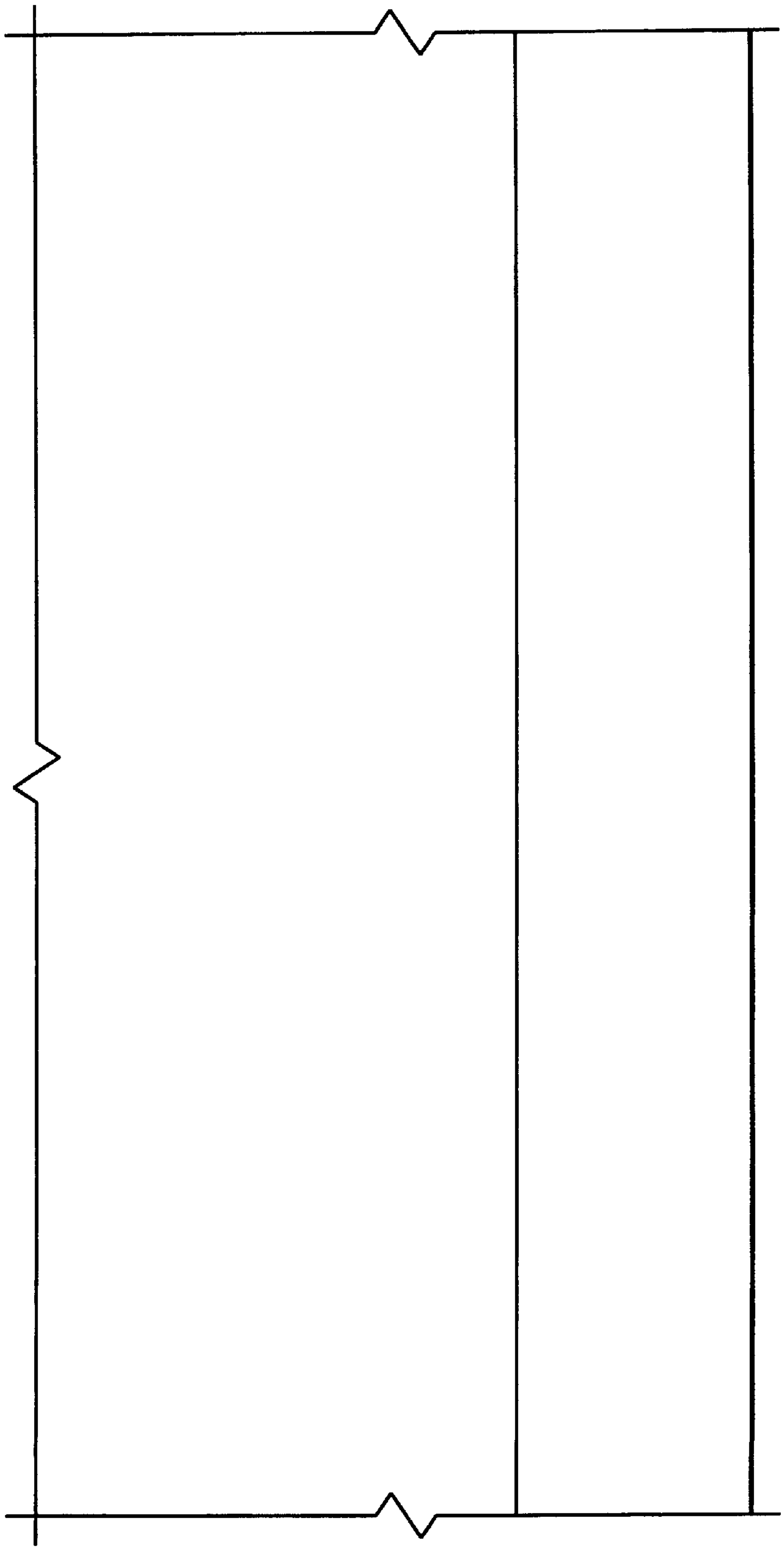
Fig. 10.0102LK

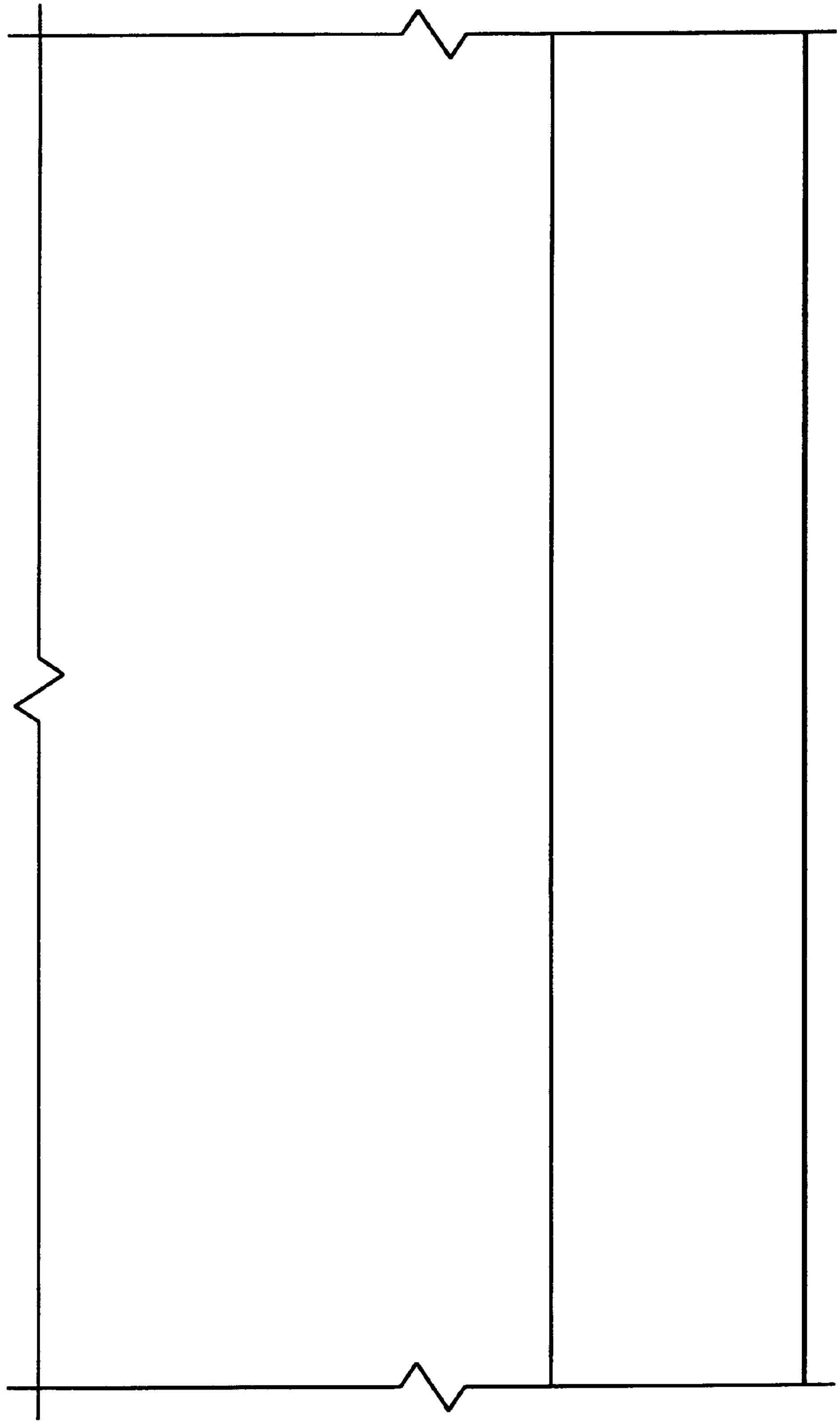
Fig. 10.0102L

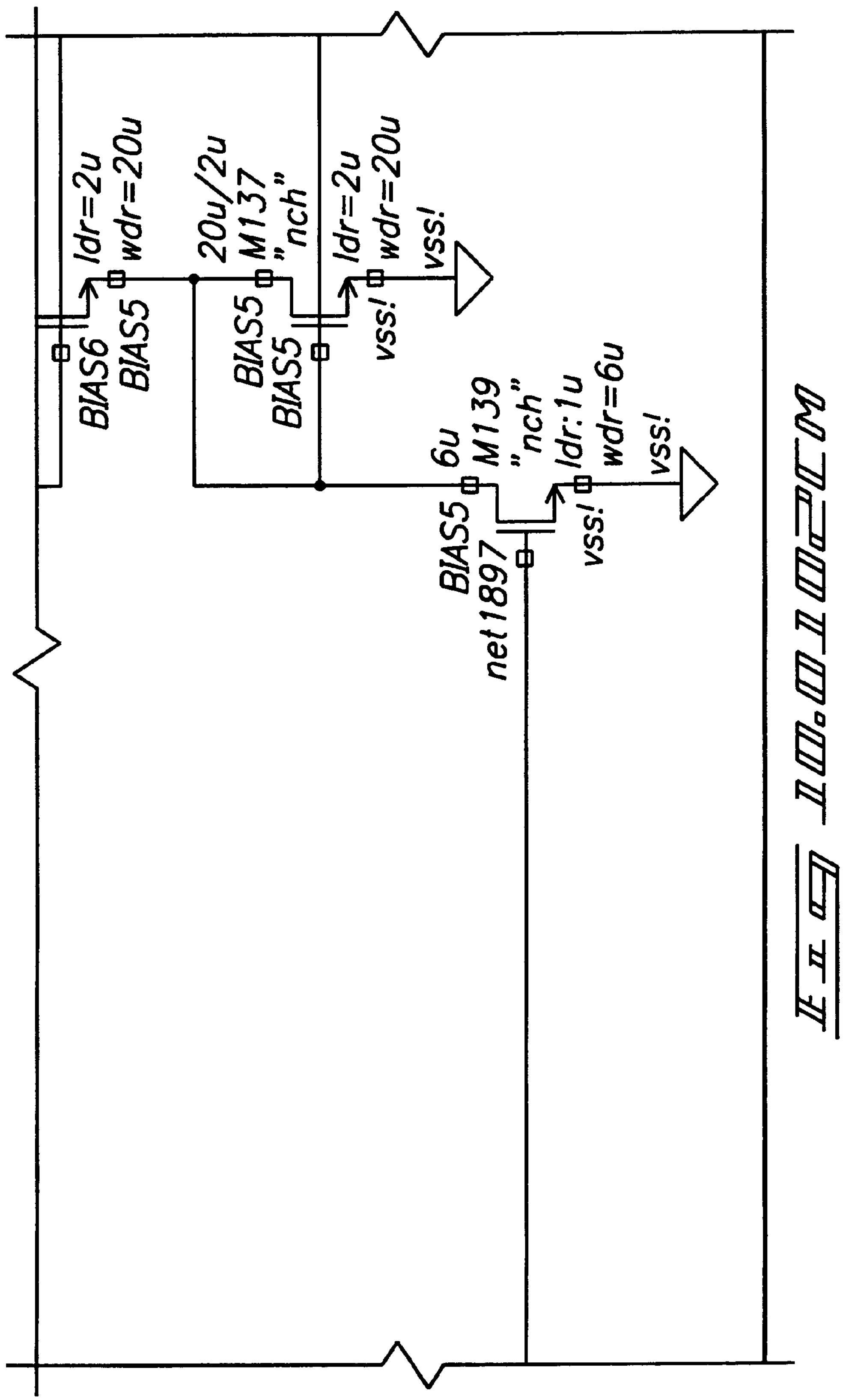
FIG. 10.0102CM

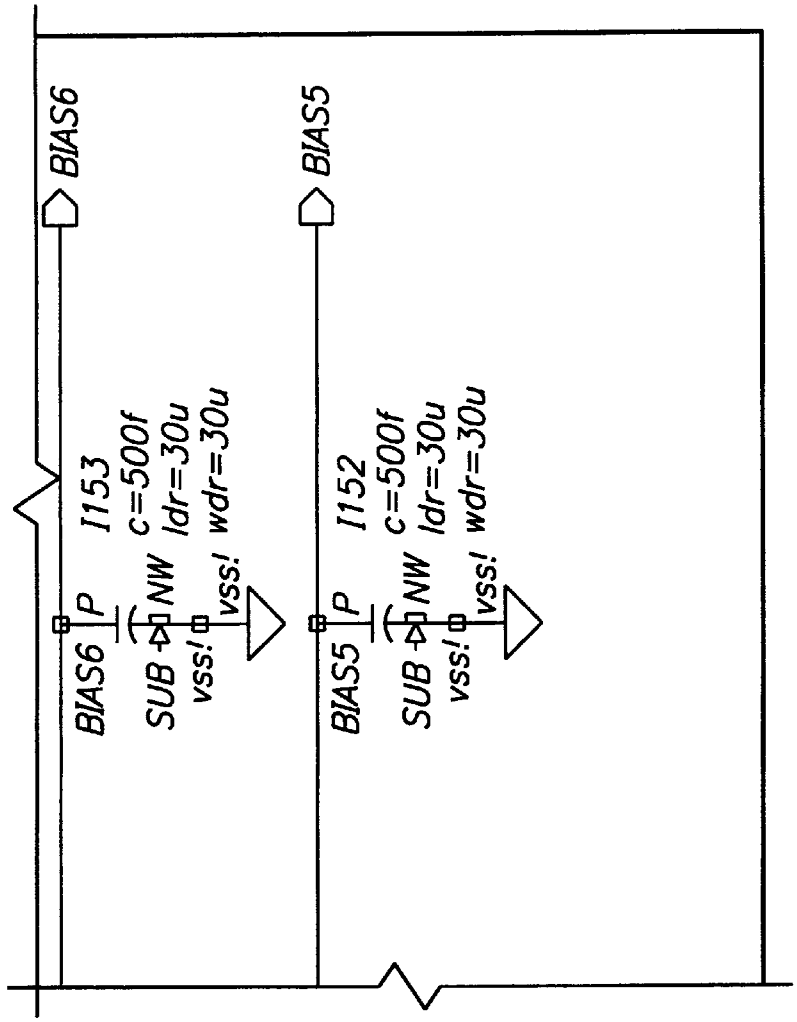
FIG. 10.010.2CN

| | | | | |
|---|---|---|---|---|
| 10.02AA | 10.02AB | 10.02AC | 10.02AD | 10.02AE |
| 10.02BA | 10.02BB | 10.02BC | 10.02BD | 10.02BE |

Fig. 10.02

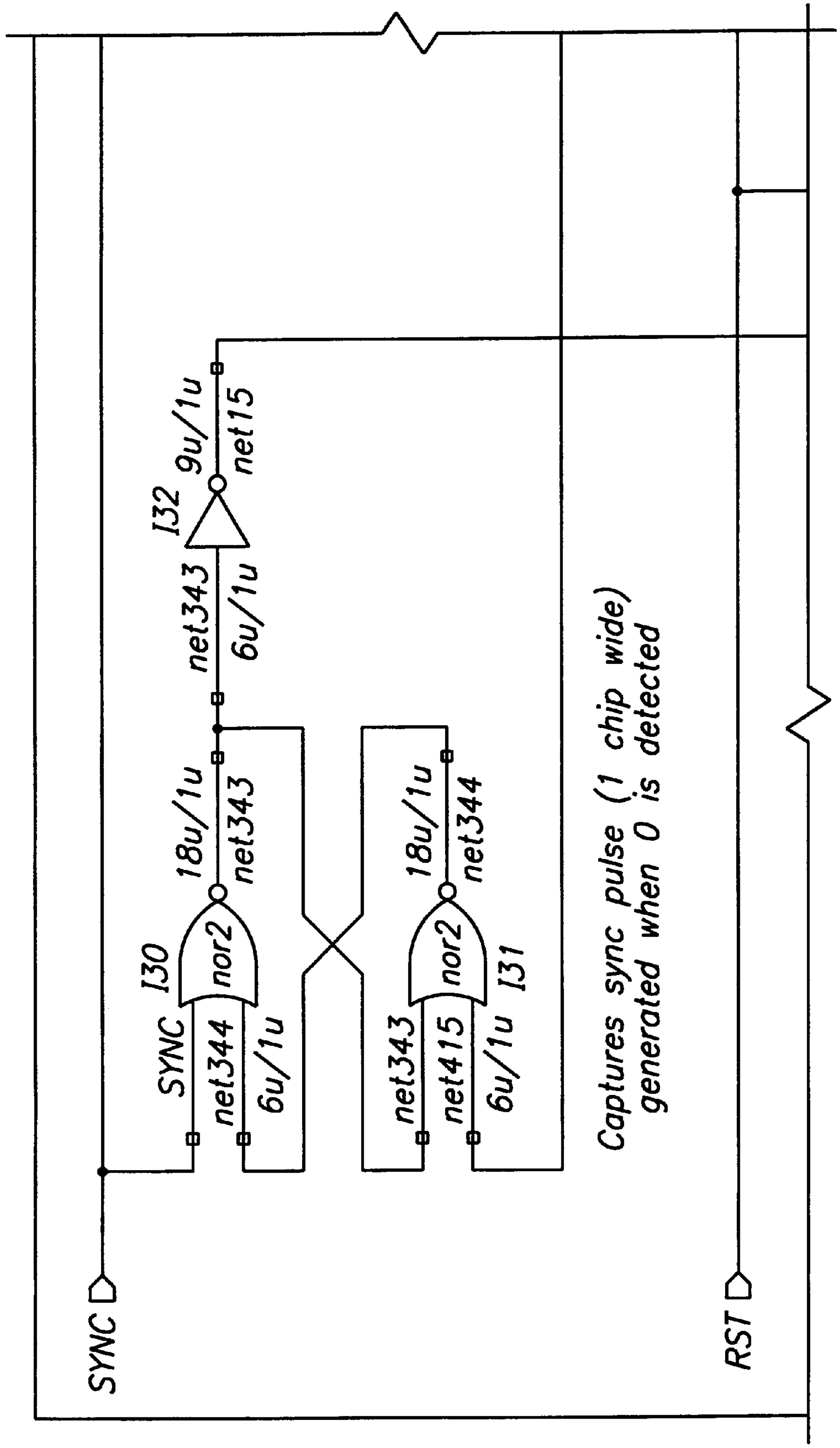
FIG. 10.02AA

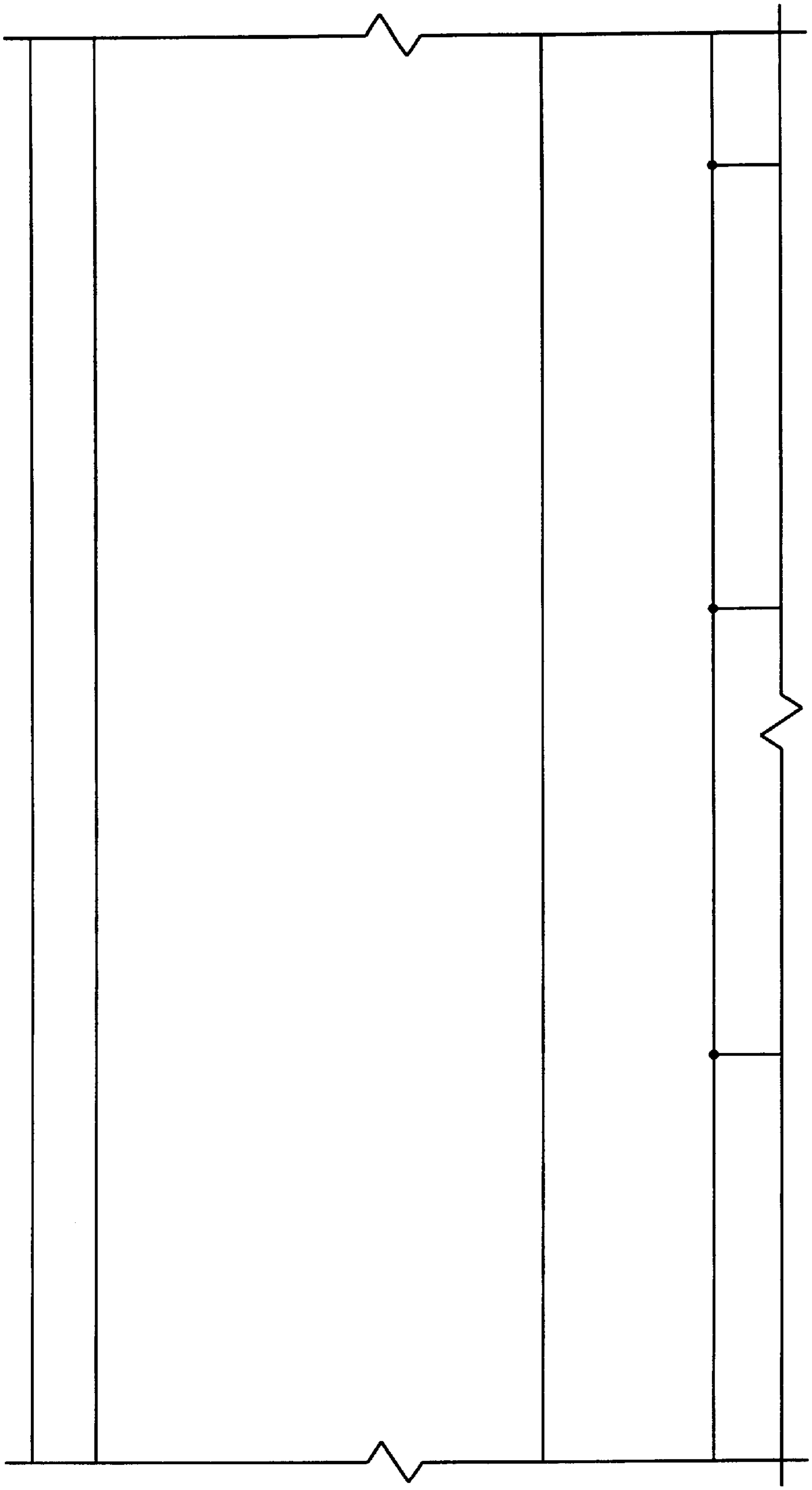
FIG. 10.02AB

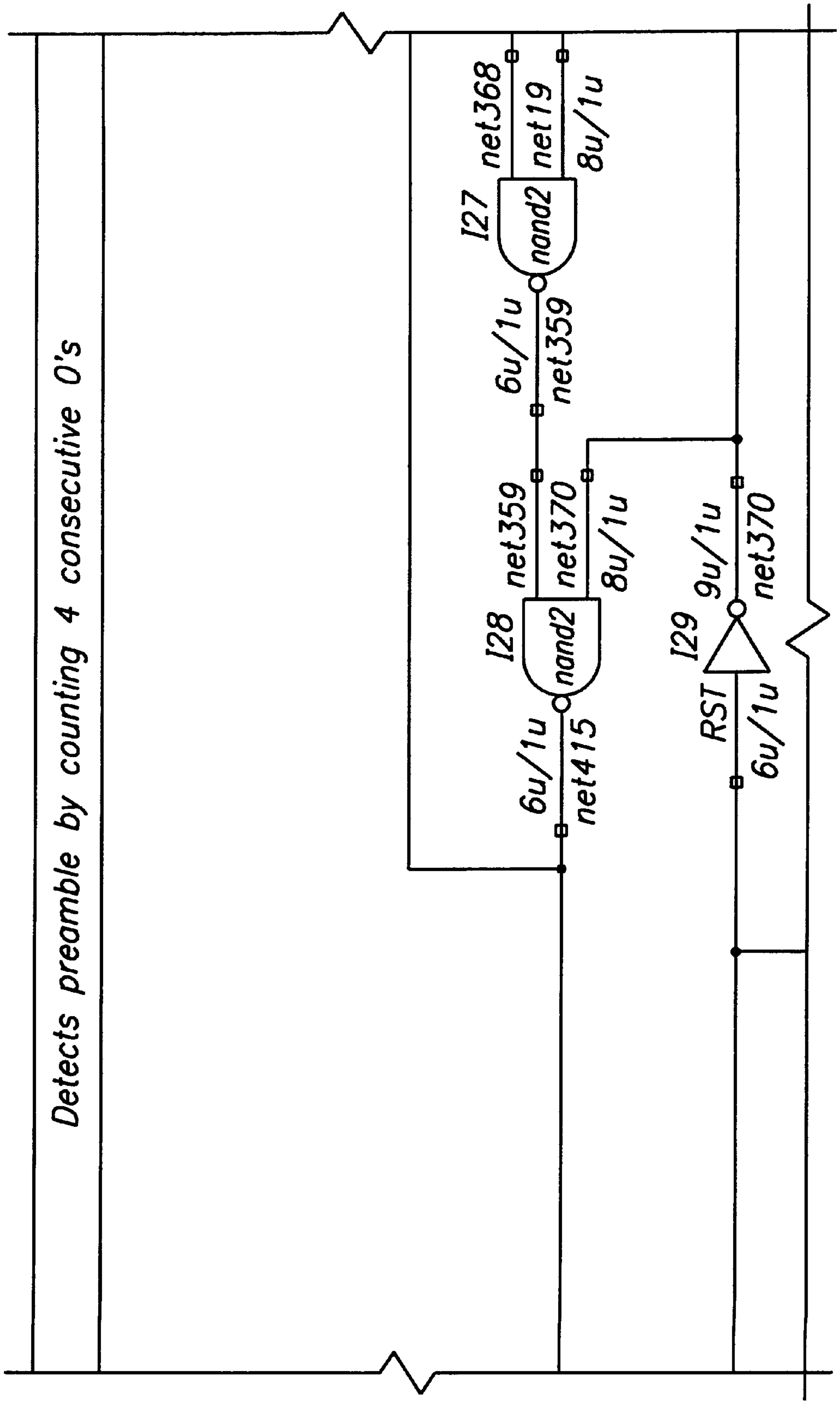
FIG. 110.02AC

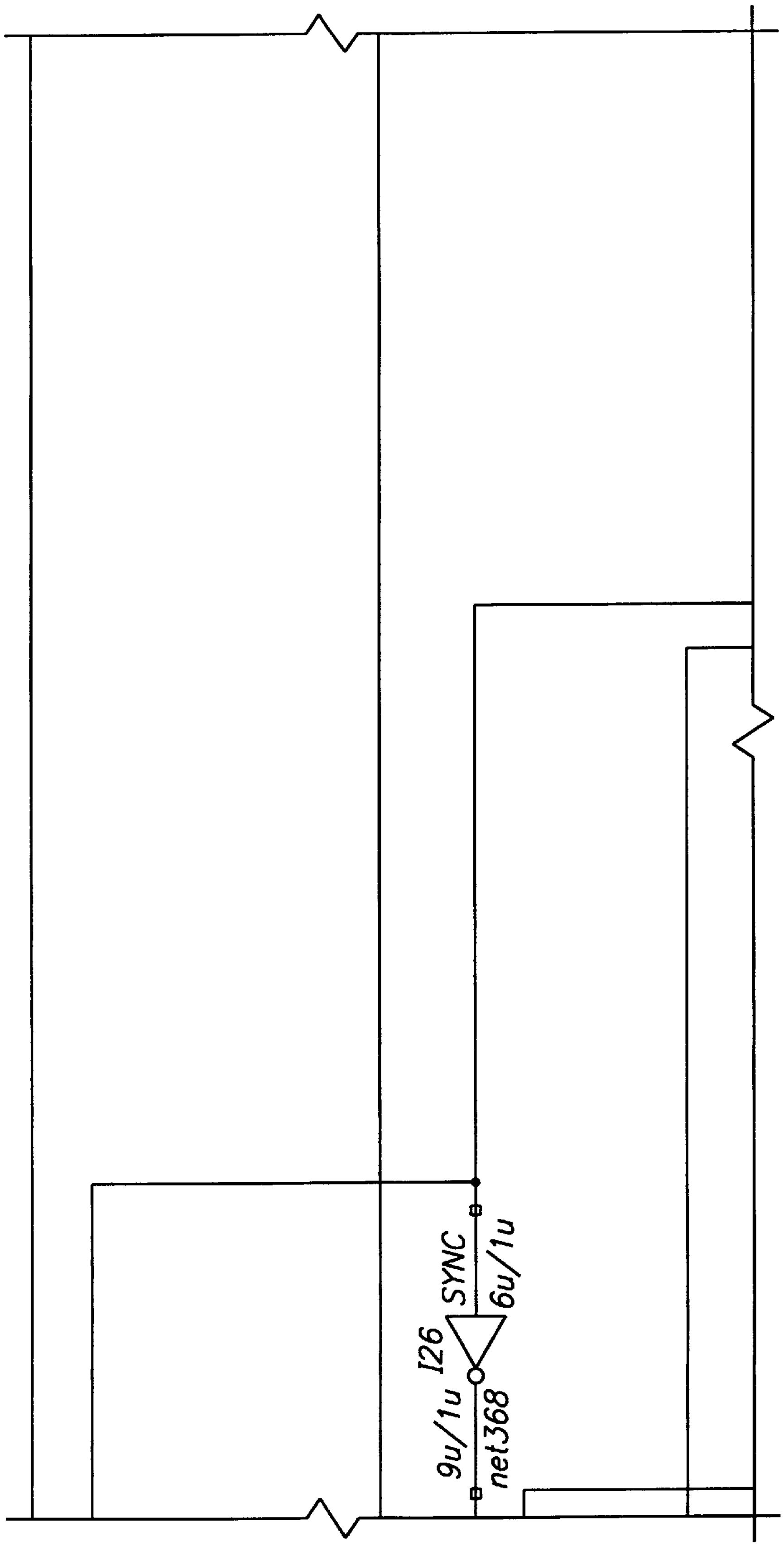
Fig. 10.002AD

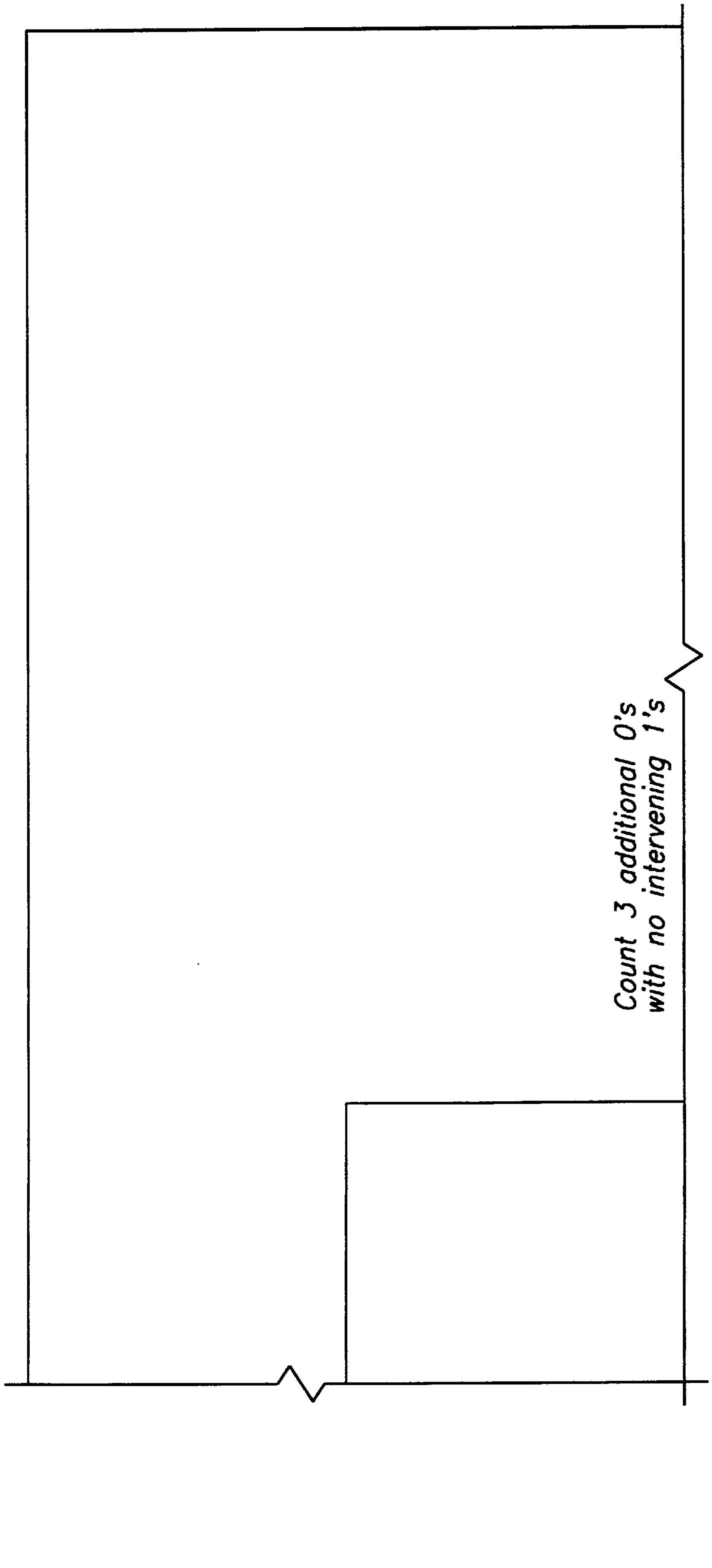
FIG. 10.02AE

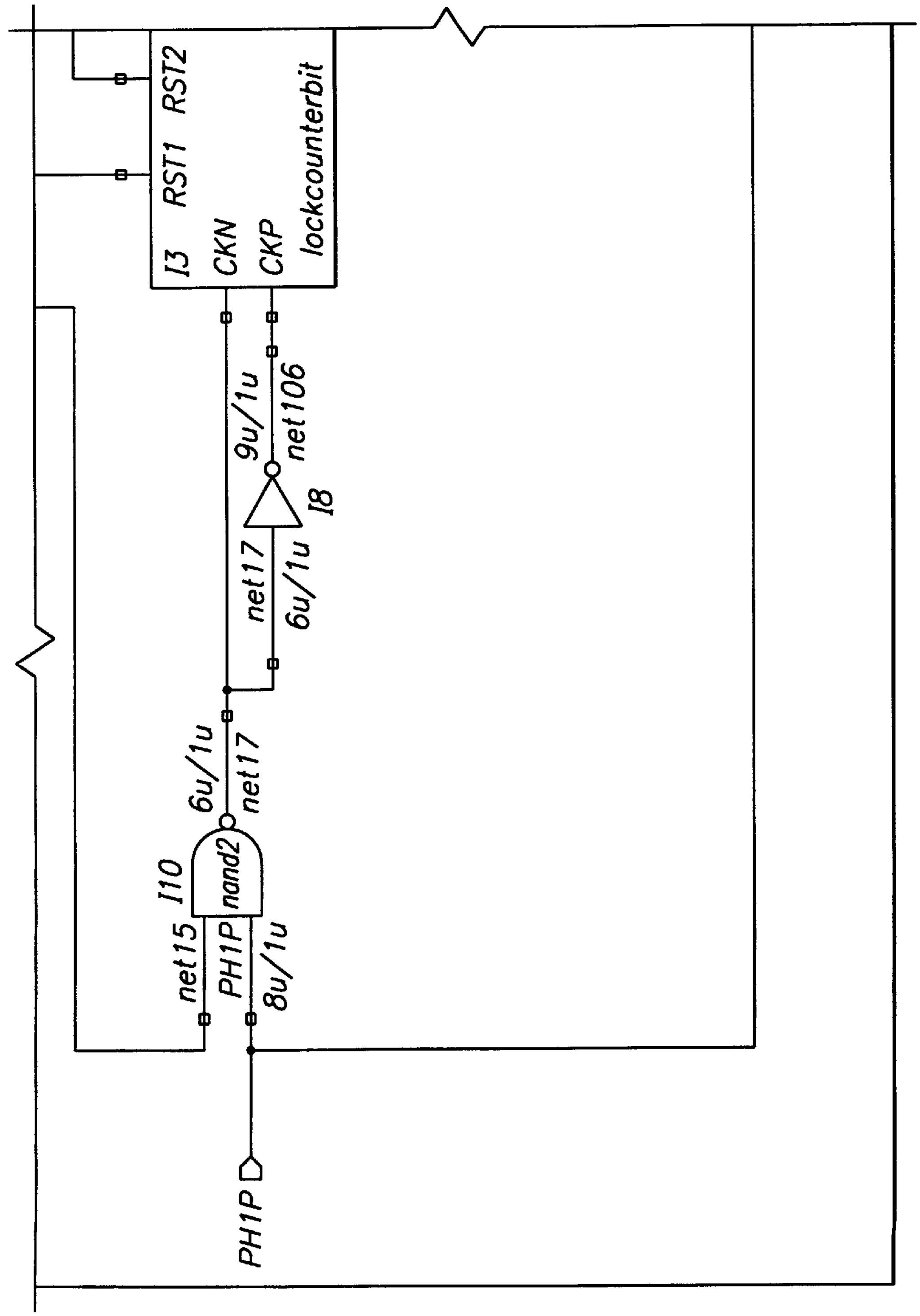
FIG. 10.02BA

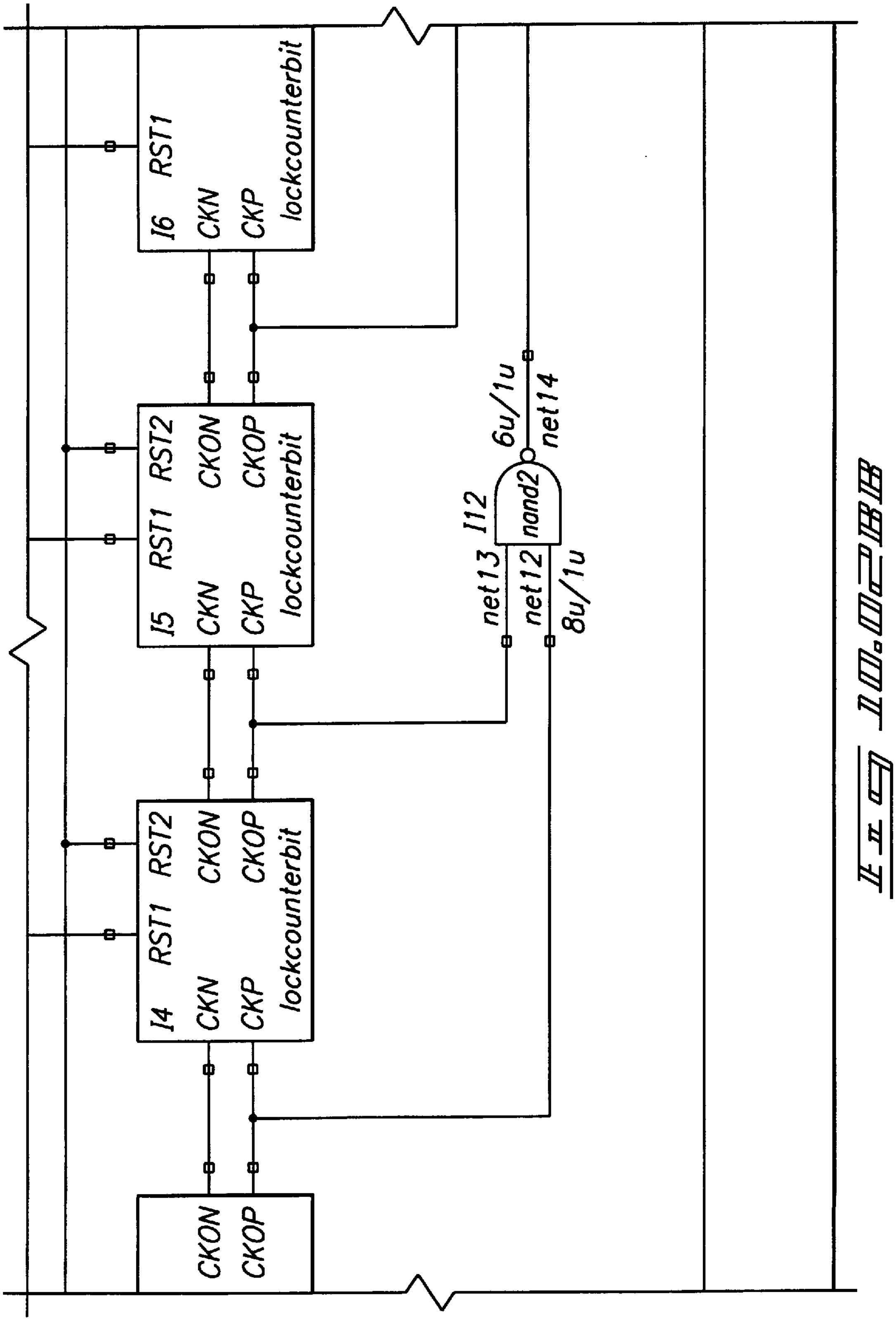
Fig 10.02BB

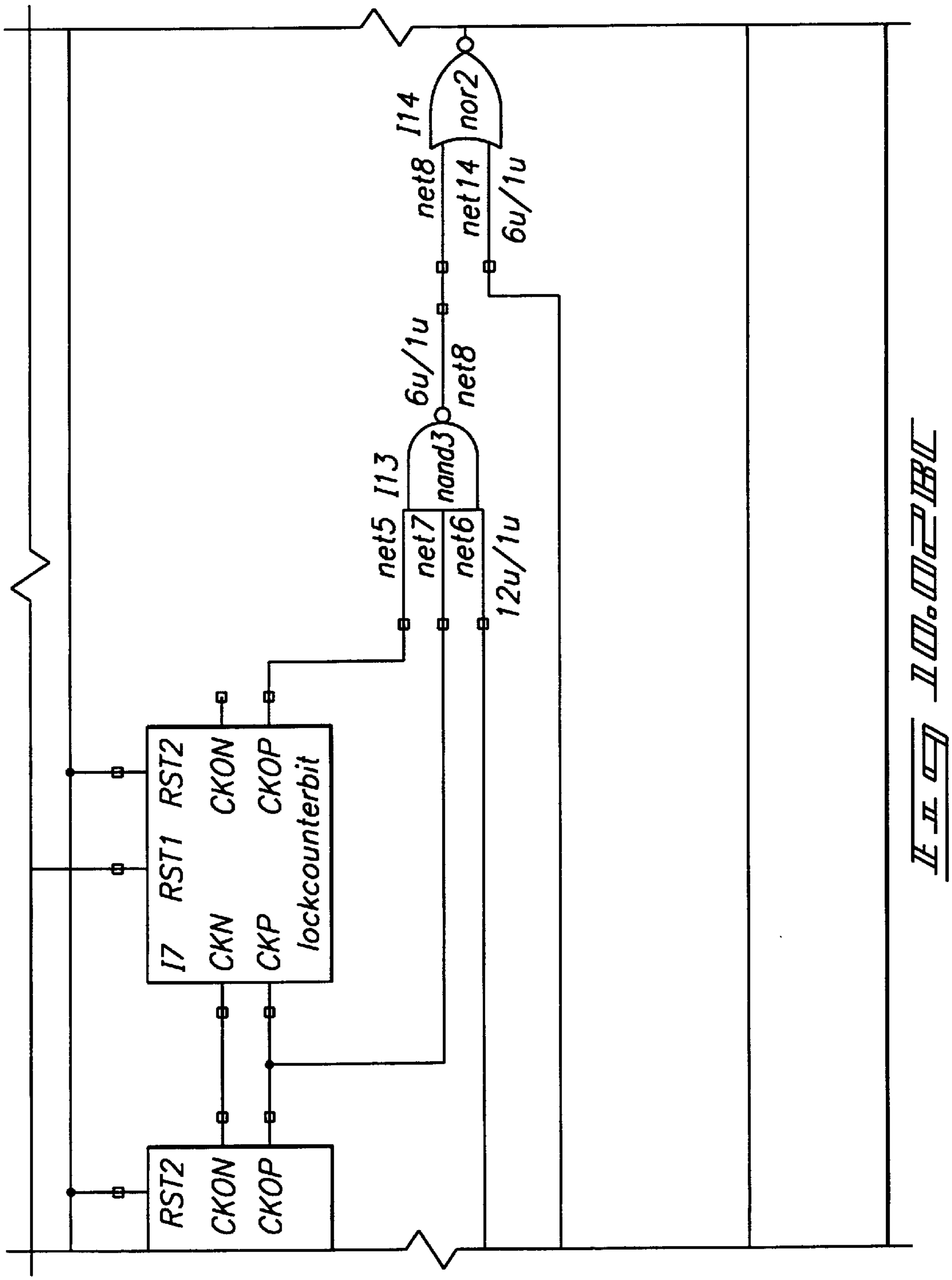
Fig. 10.02BC

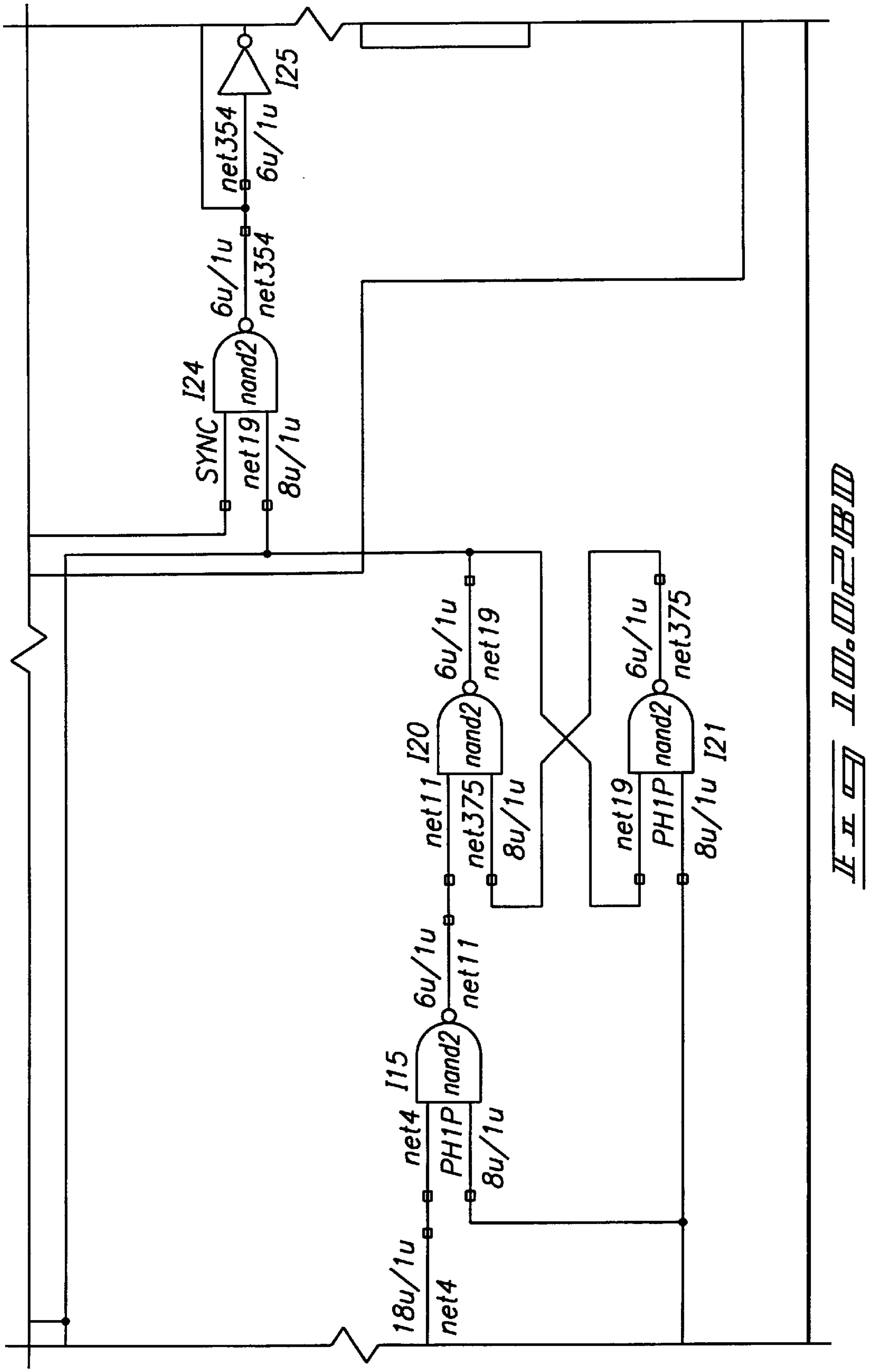
Fig. 10.02BD

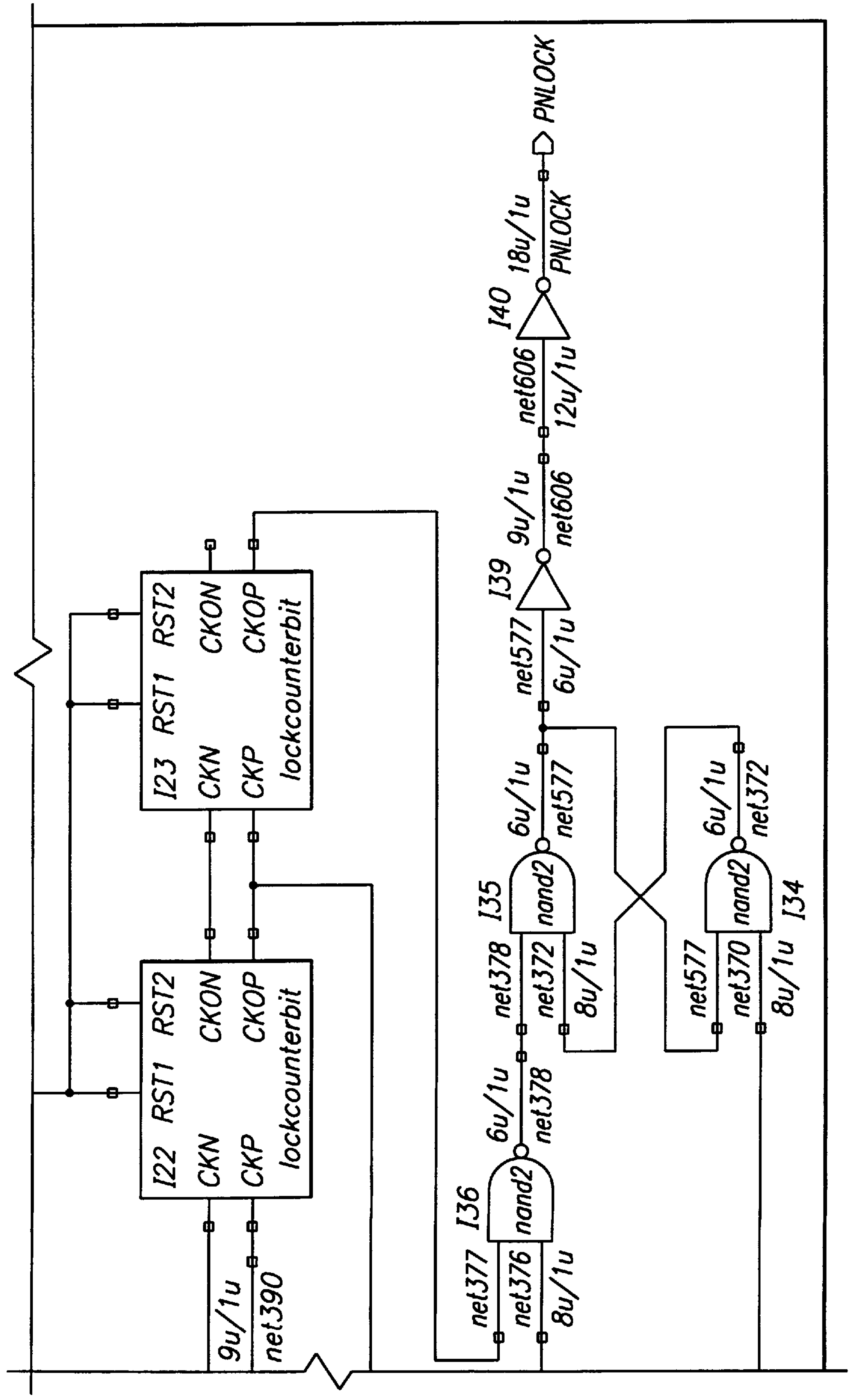
FIG. 10.02BE

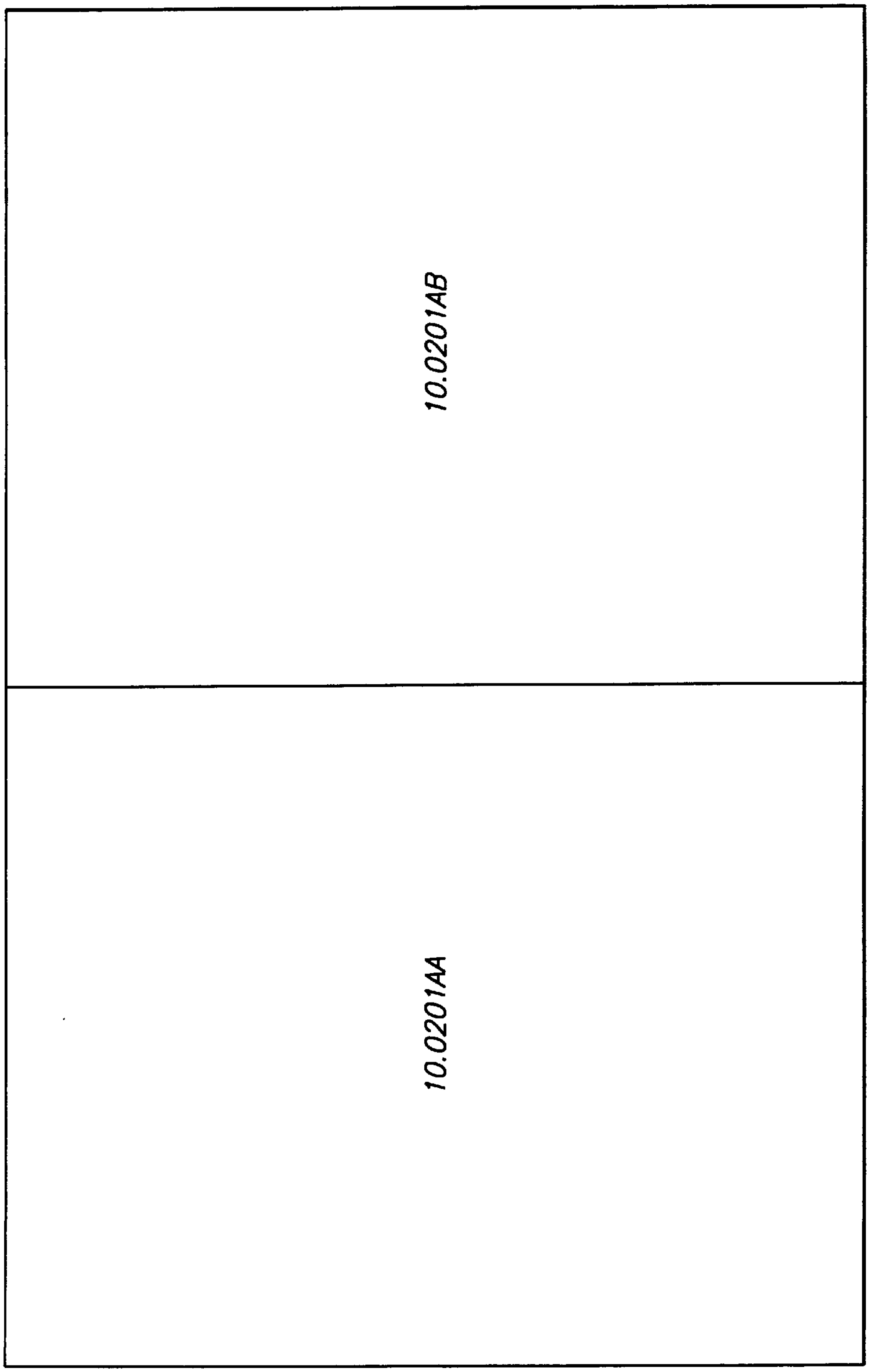
FIG. 10.0201

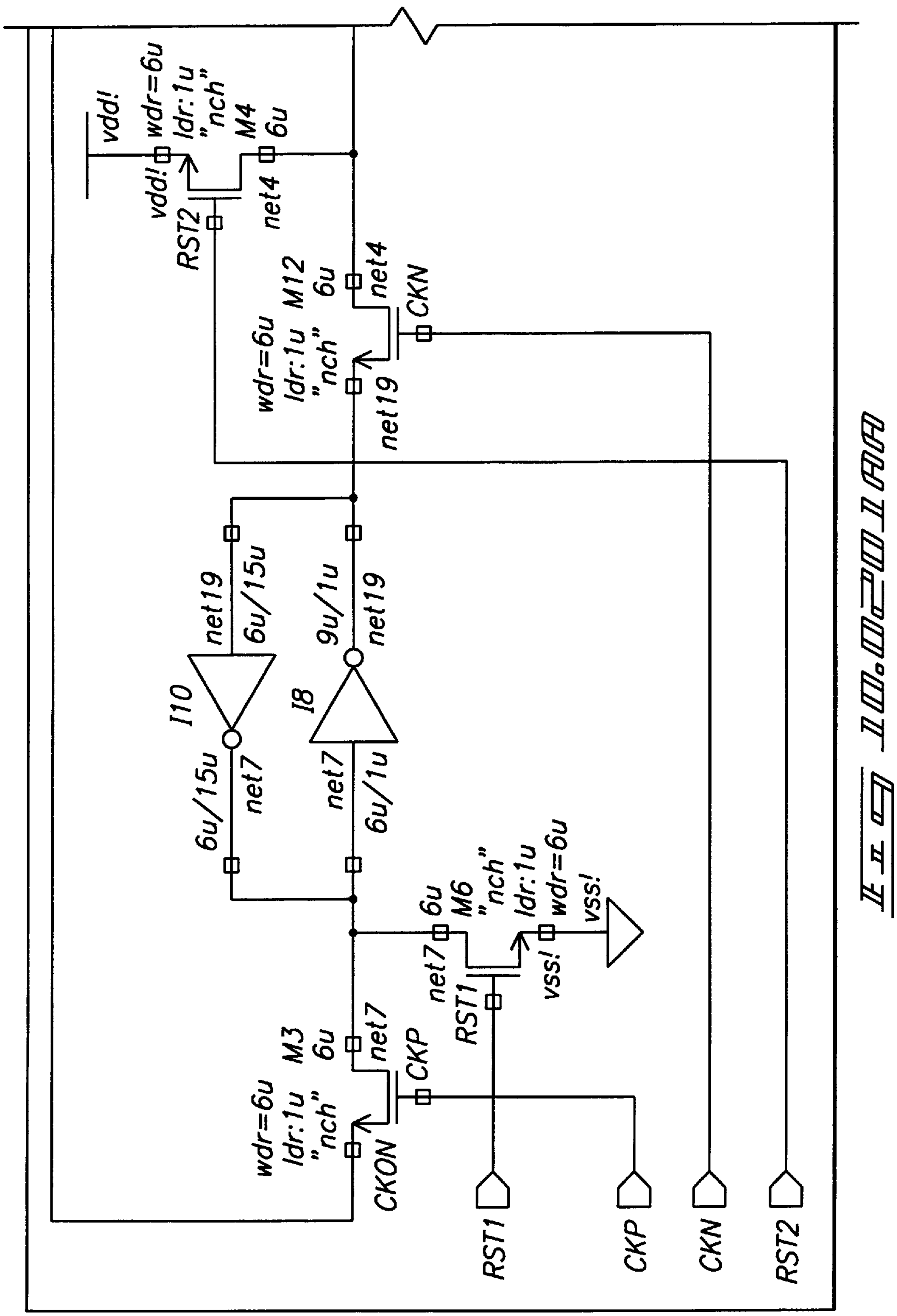
FIG 10.0201AA

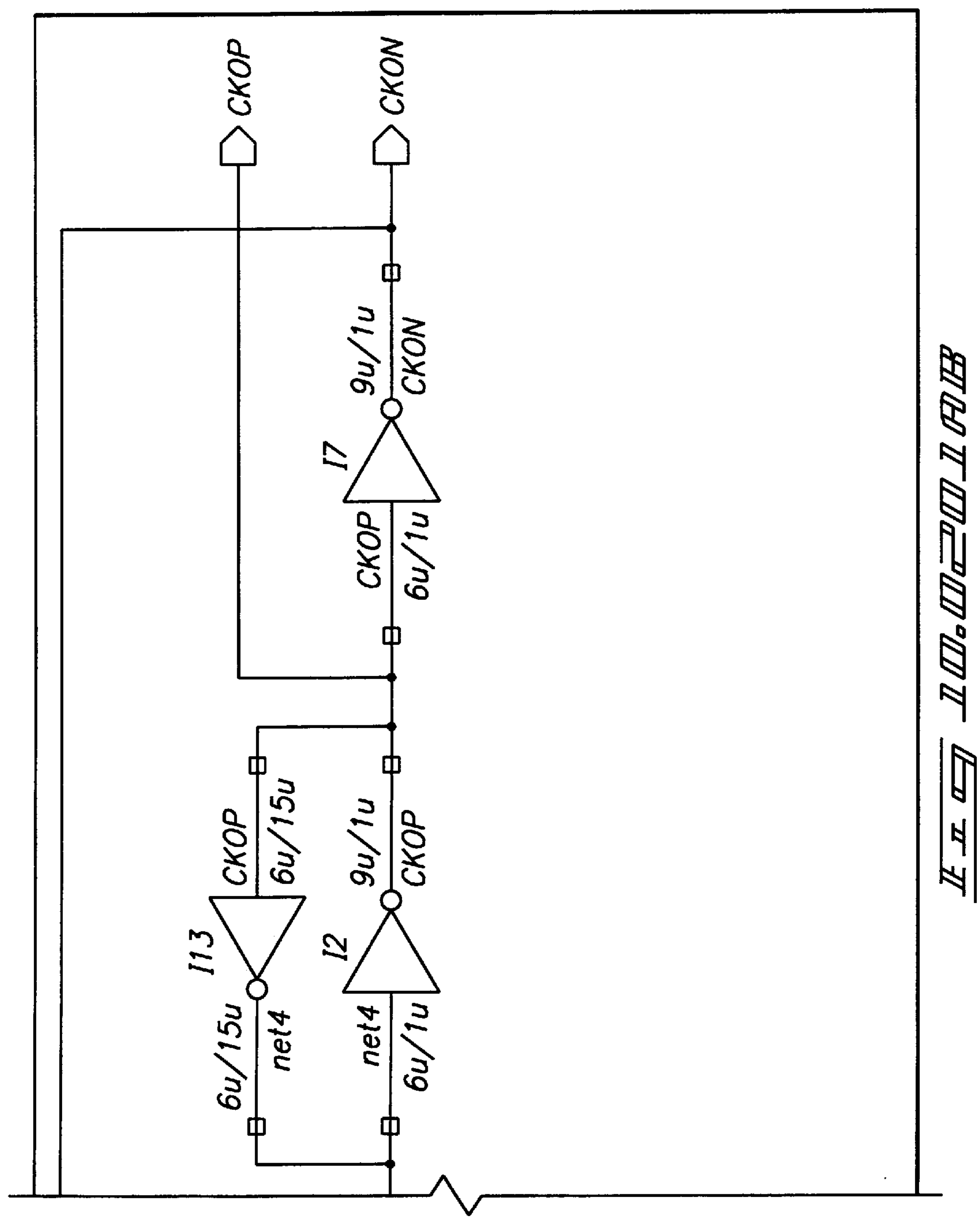
Fig. 10.0201AB

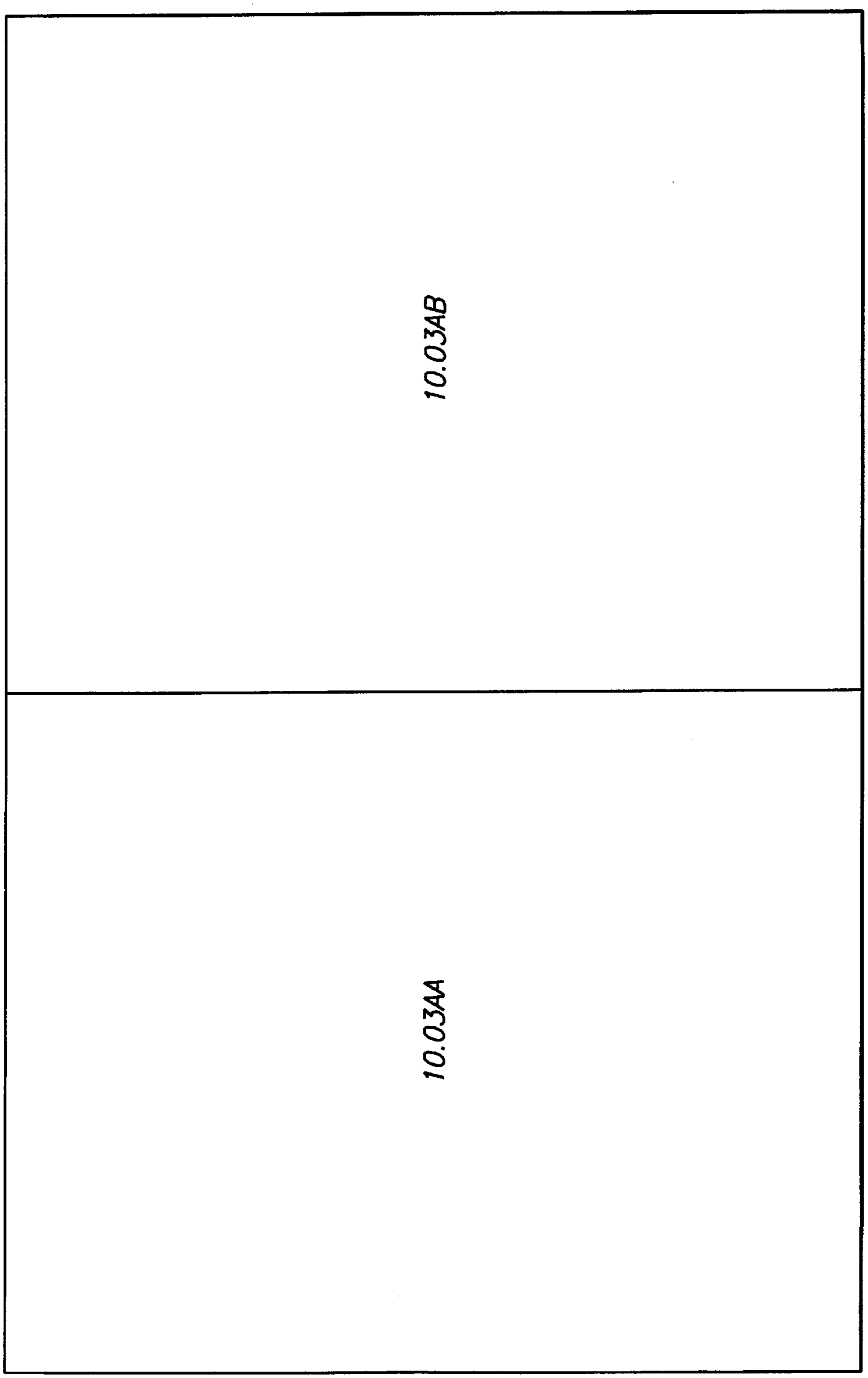
FIG. 10.03

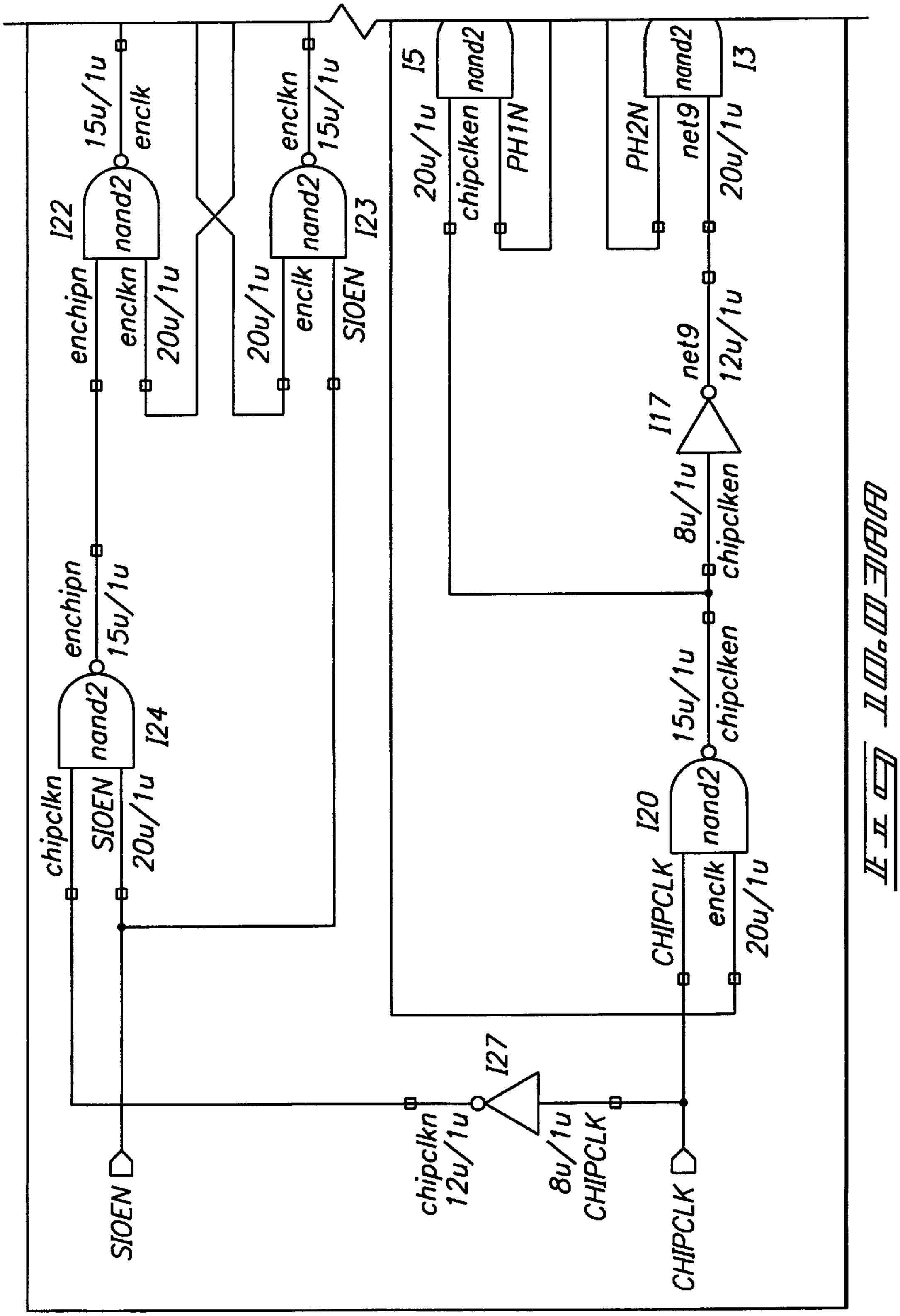
FIG. 10.00AA

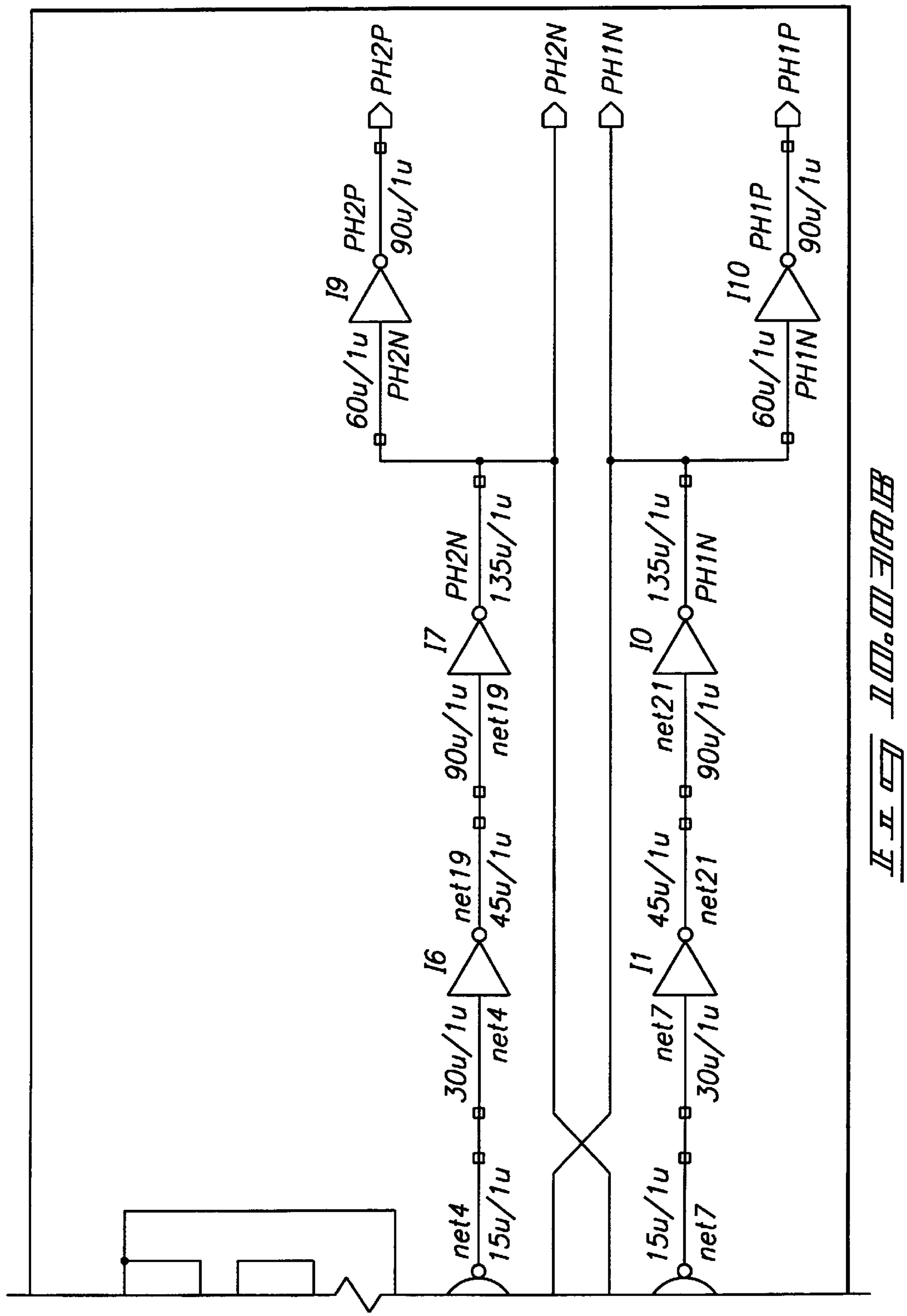
Fig. 10.03AB

| | | | | |
|---|---|---|---|---|
| 10.04AA | 10.04AB | 10.04AC | 10.04AD | 10.04AE |
| 10.04BA | 10.04BB | 10.04BC | 10.04BD | 10.04BE |
| 10.04CA | 10.04CB | 10.04CC | 10.04CD | 10.04CE |

FIG. 10.04

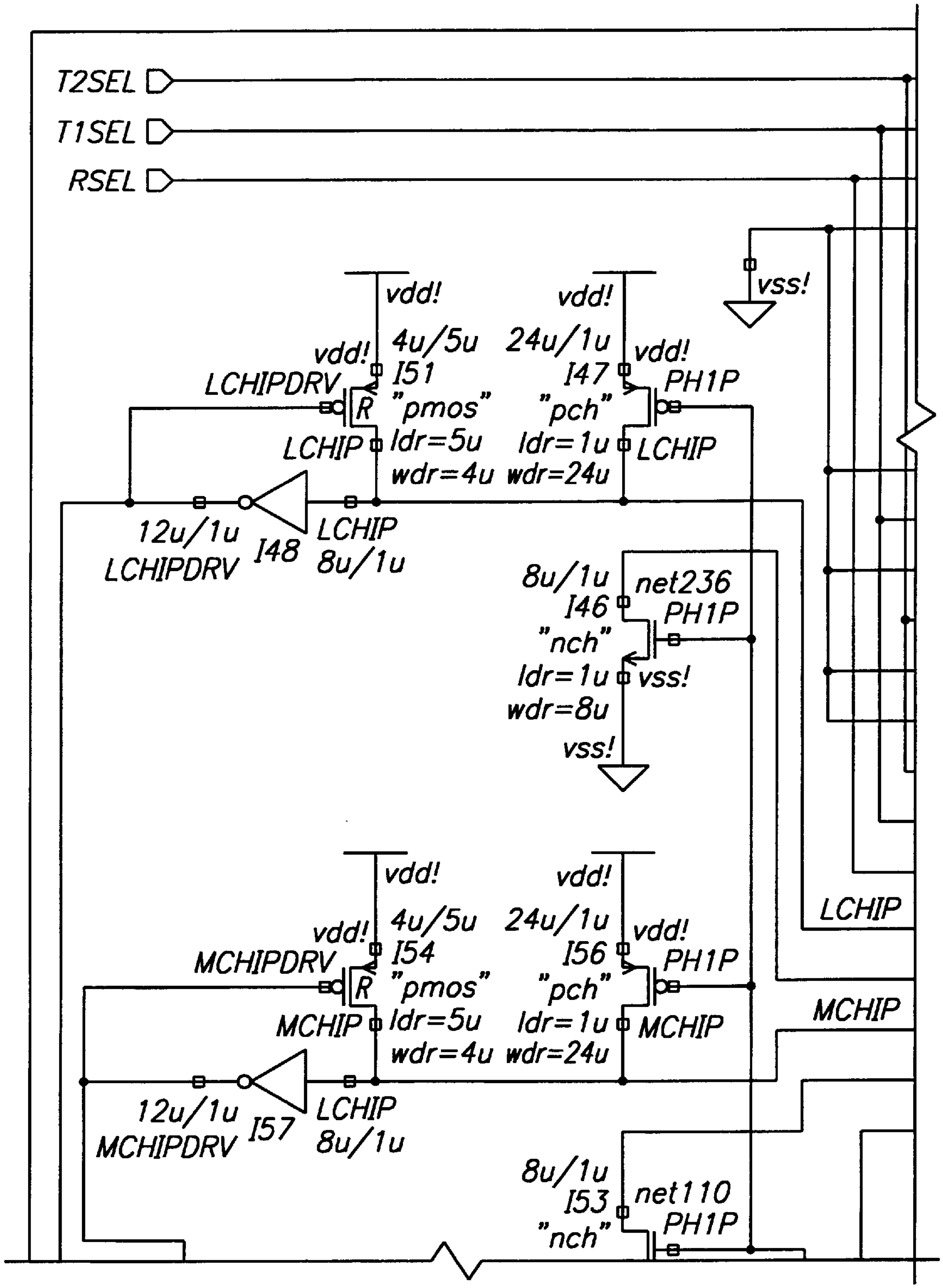
Fig 10.04AA

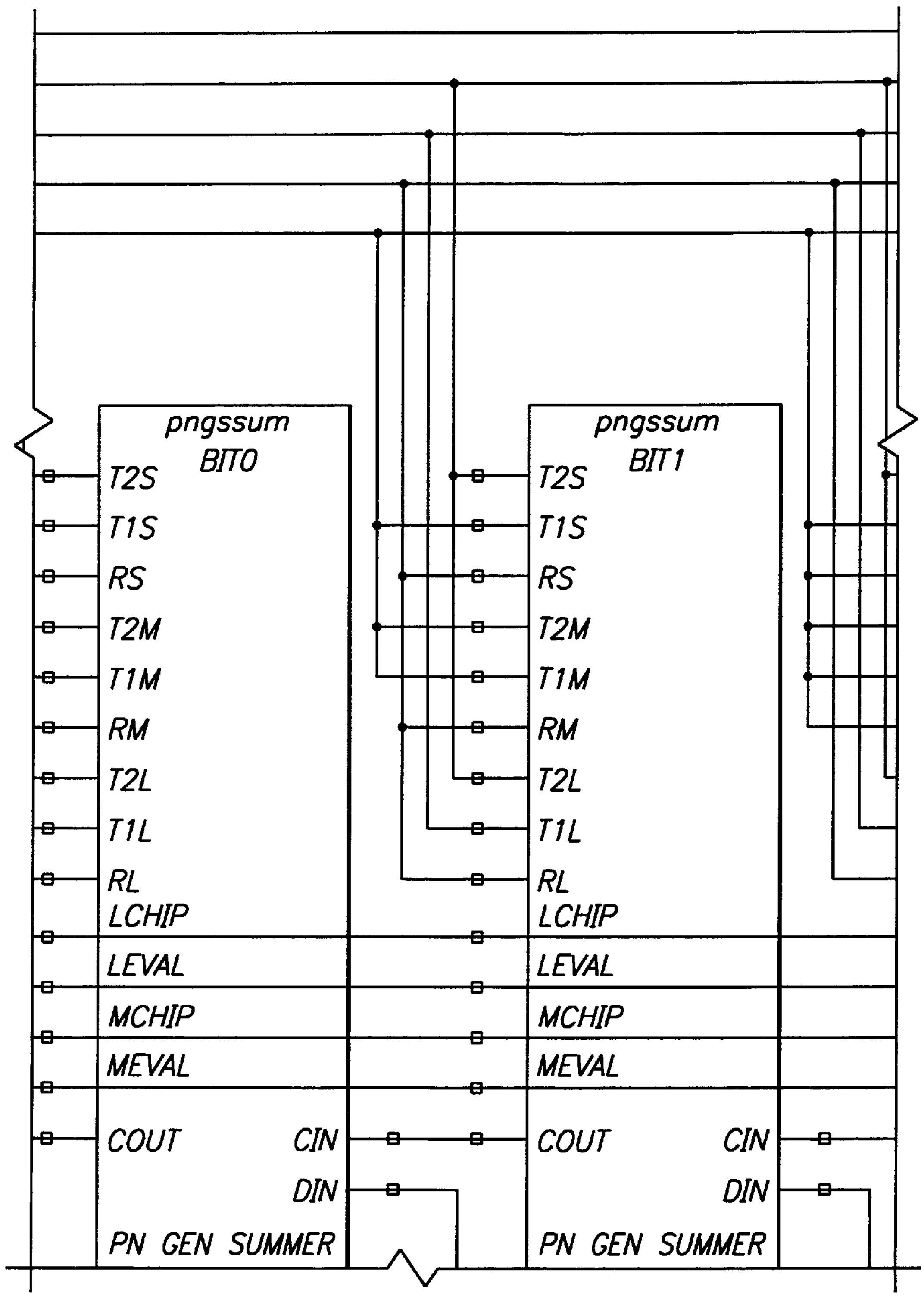
Fig. 10.04AB

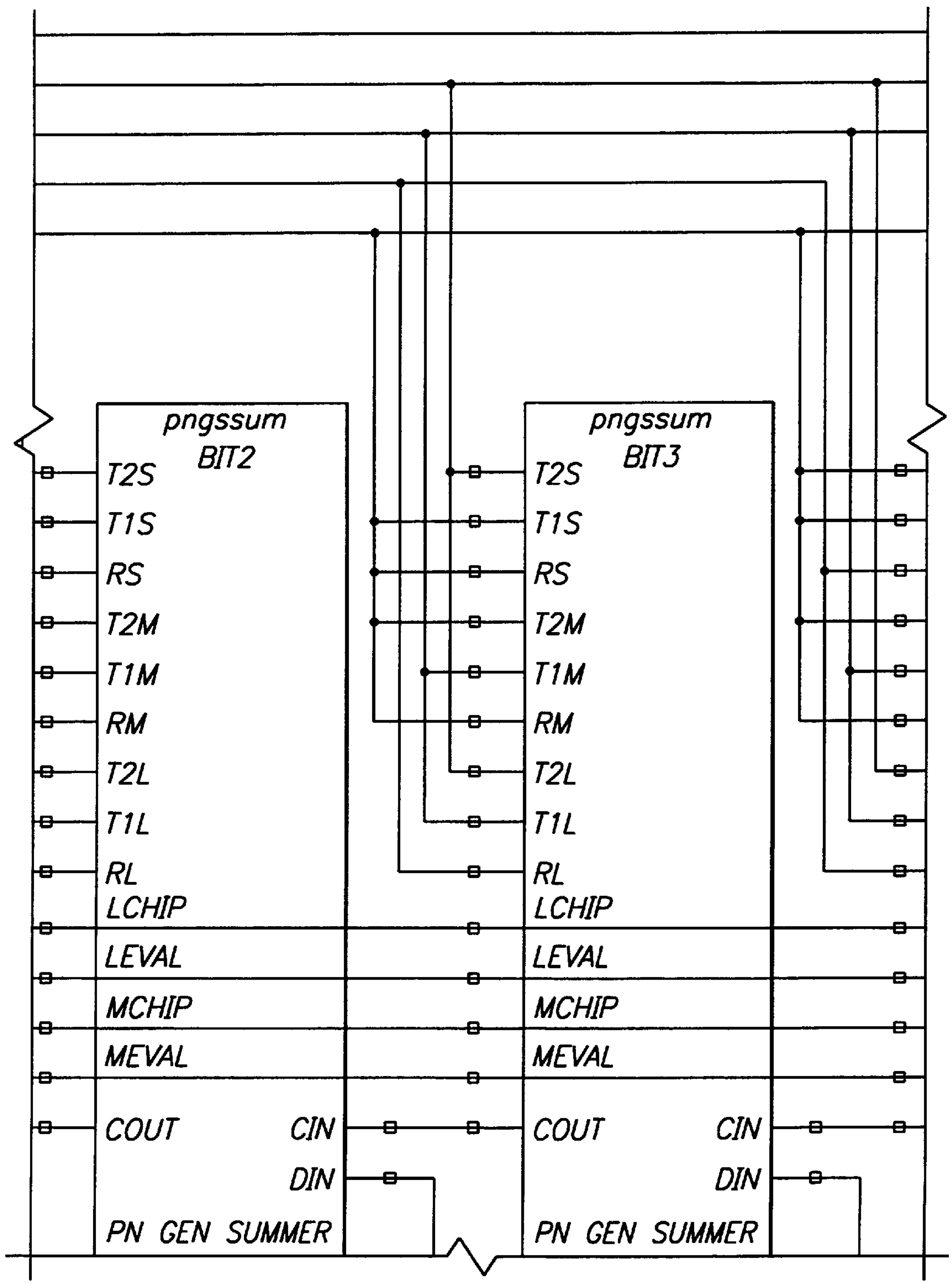
Fig 10.04AC

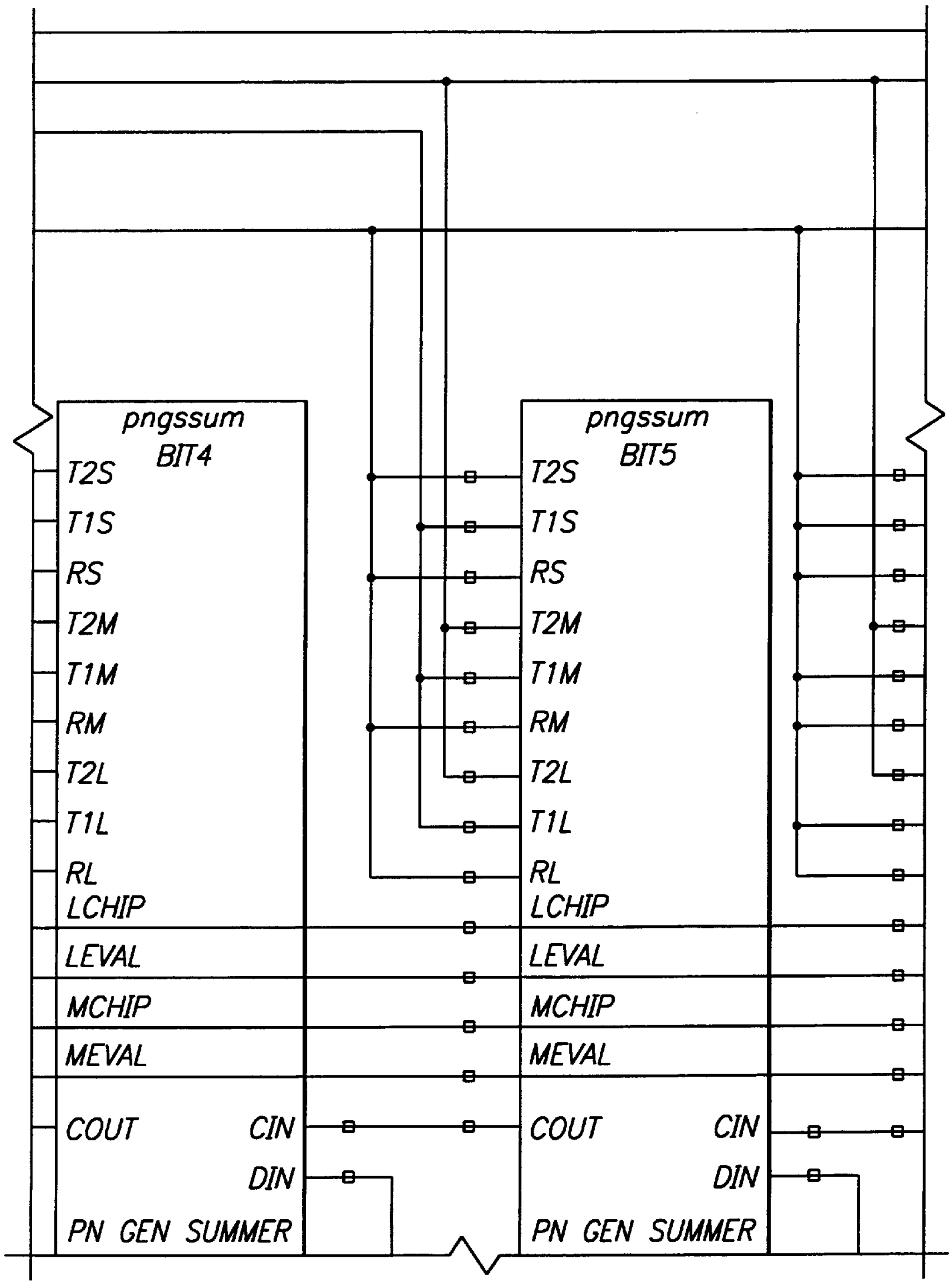
Fig 10.04AD

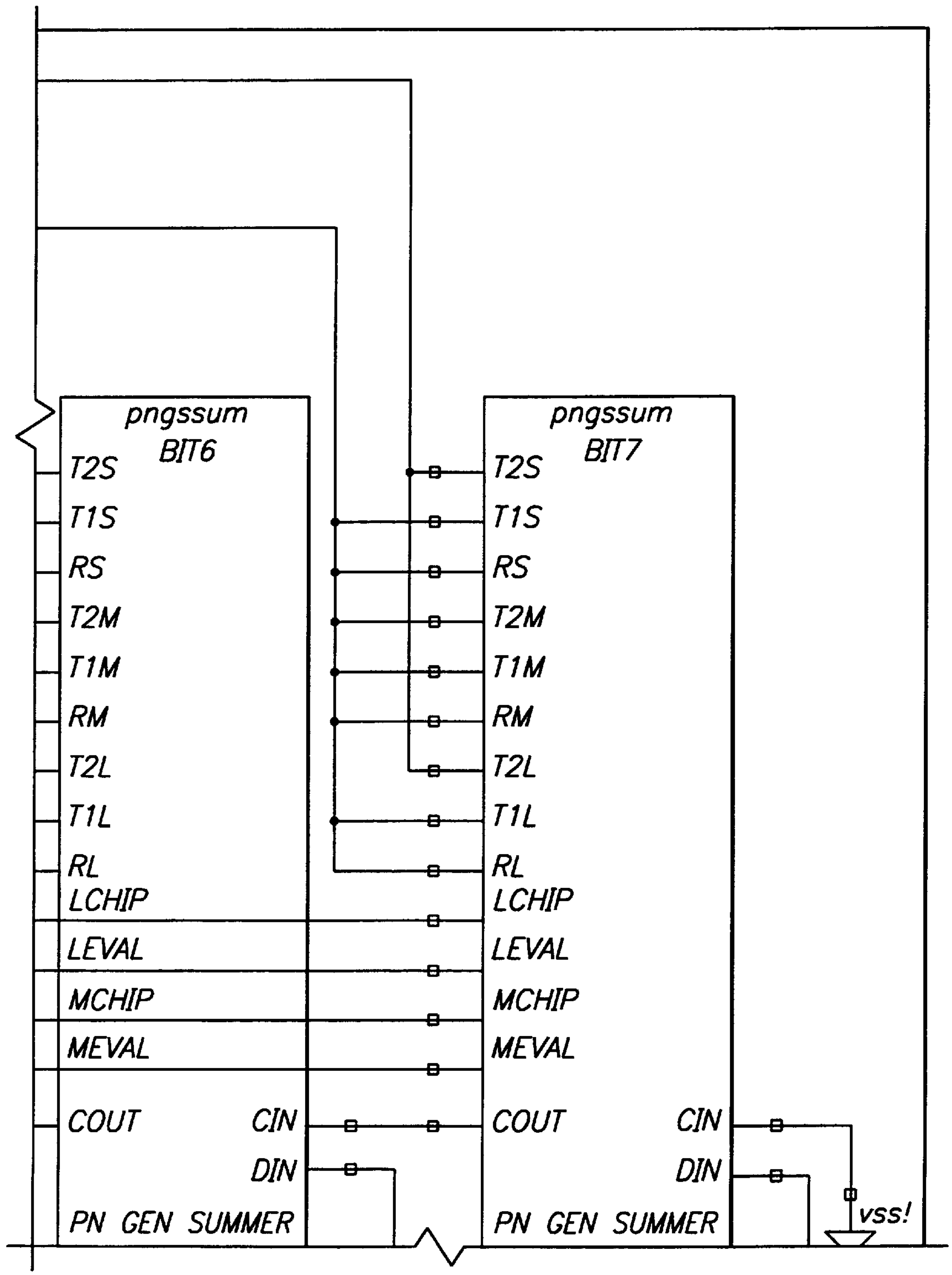
Fig. 10.04AE

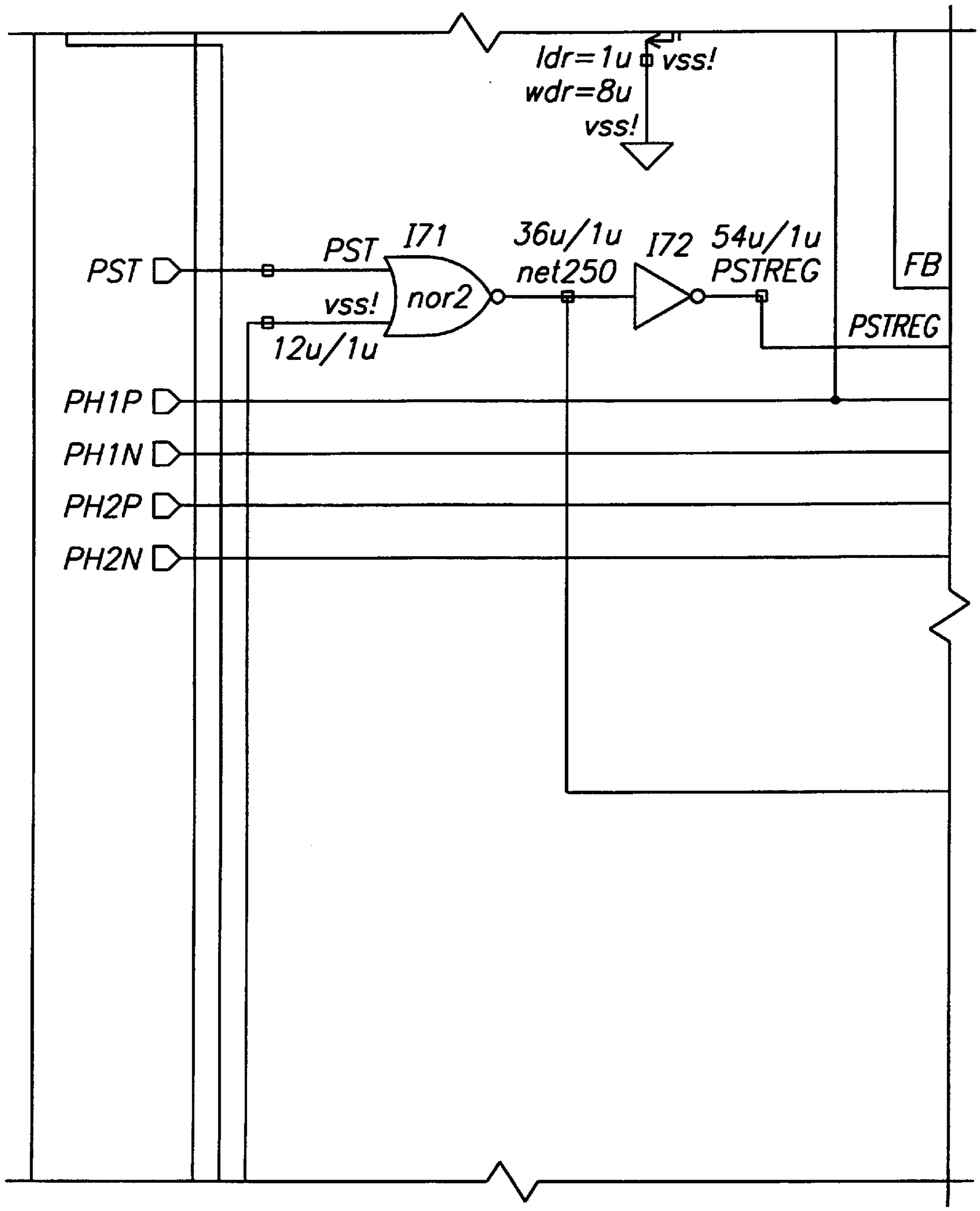
Fig 10.041BA

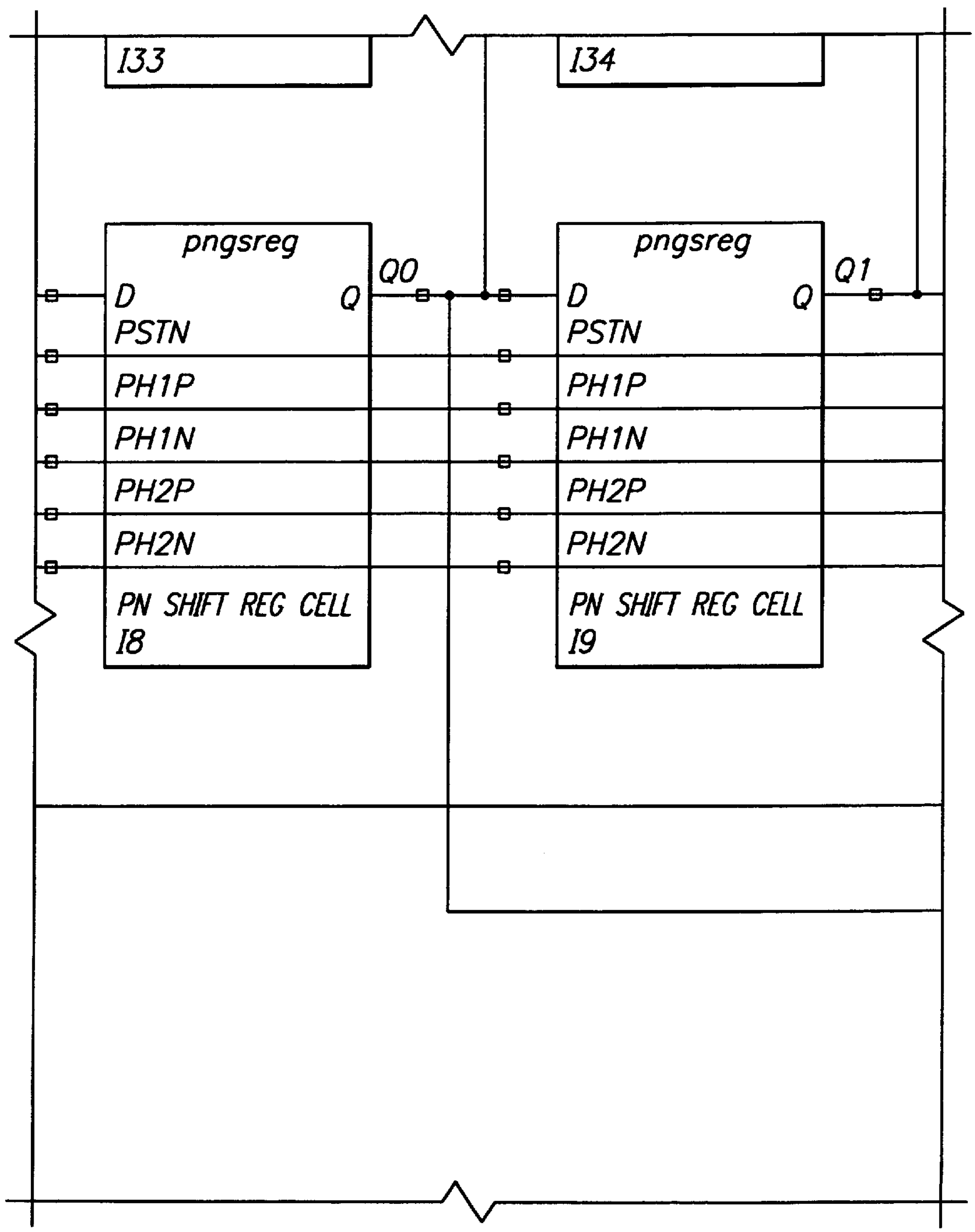
Fig 10.04BB

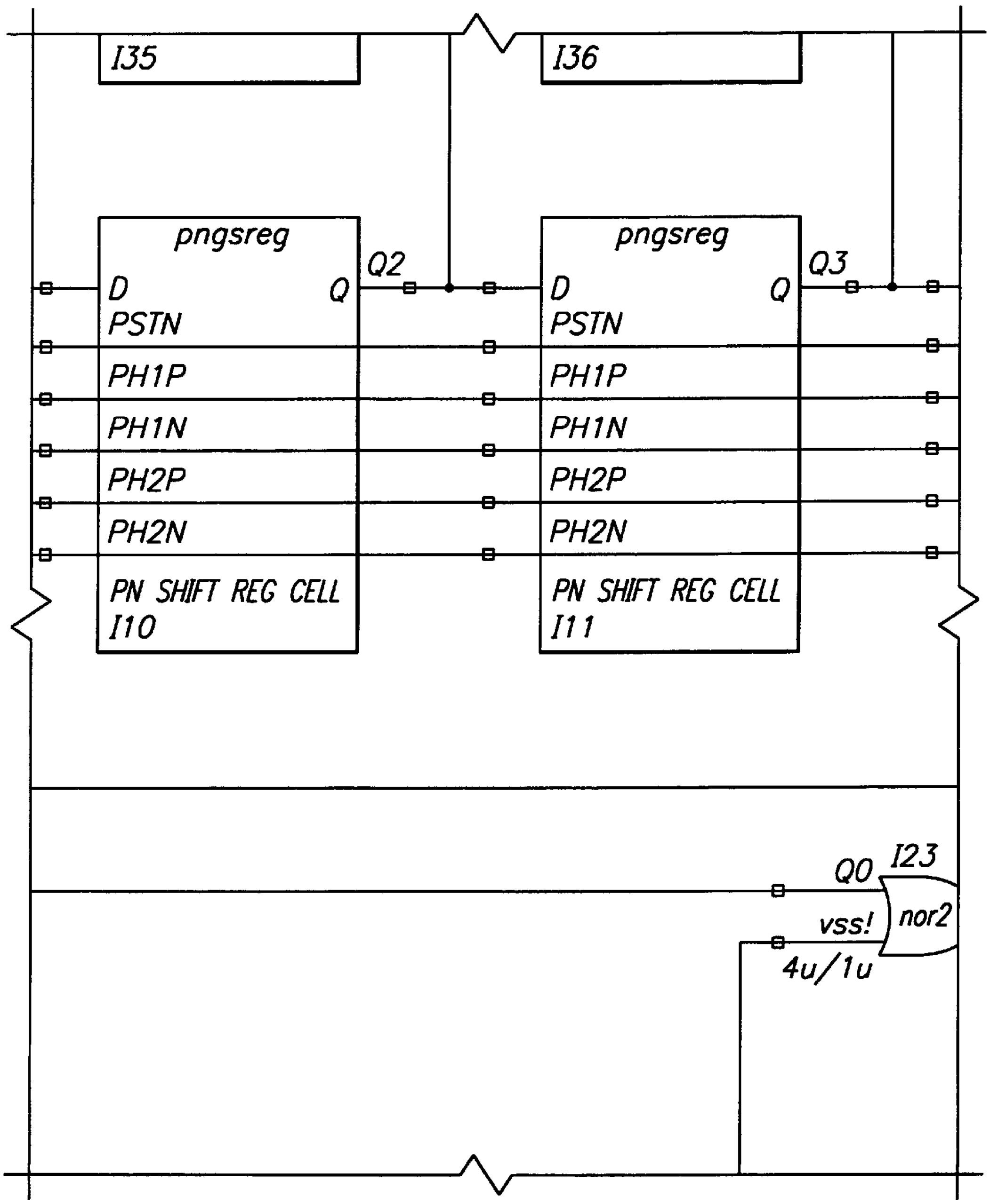
Fig 10.04BC

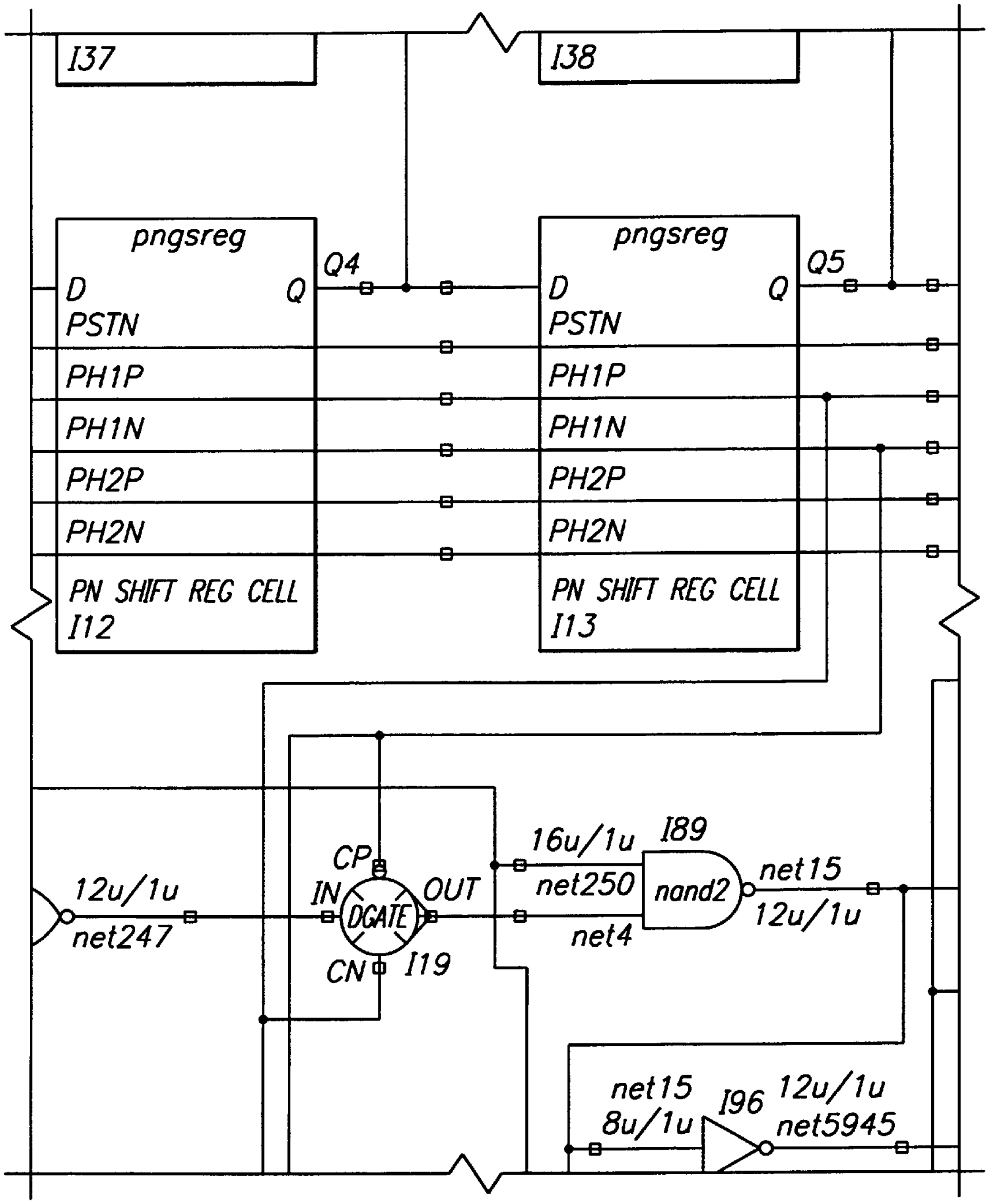
Fig 10.04BD

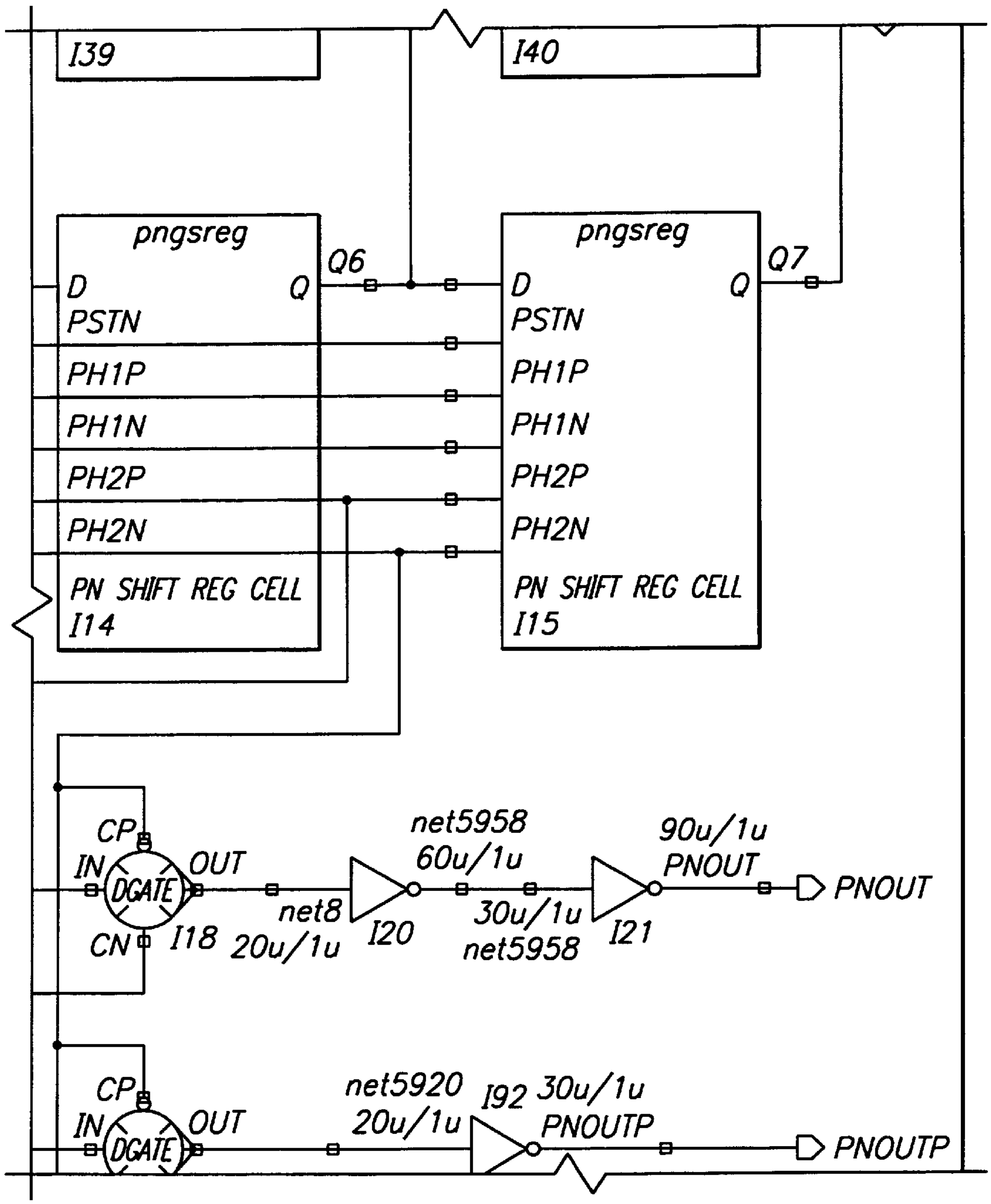
Fig 10.04BE

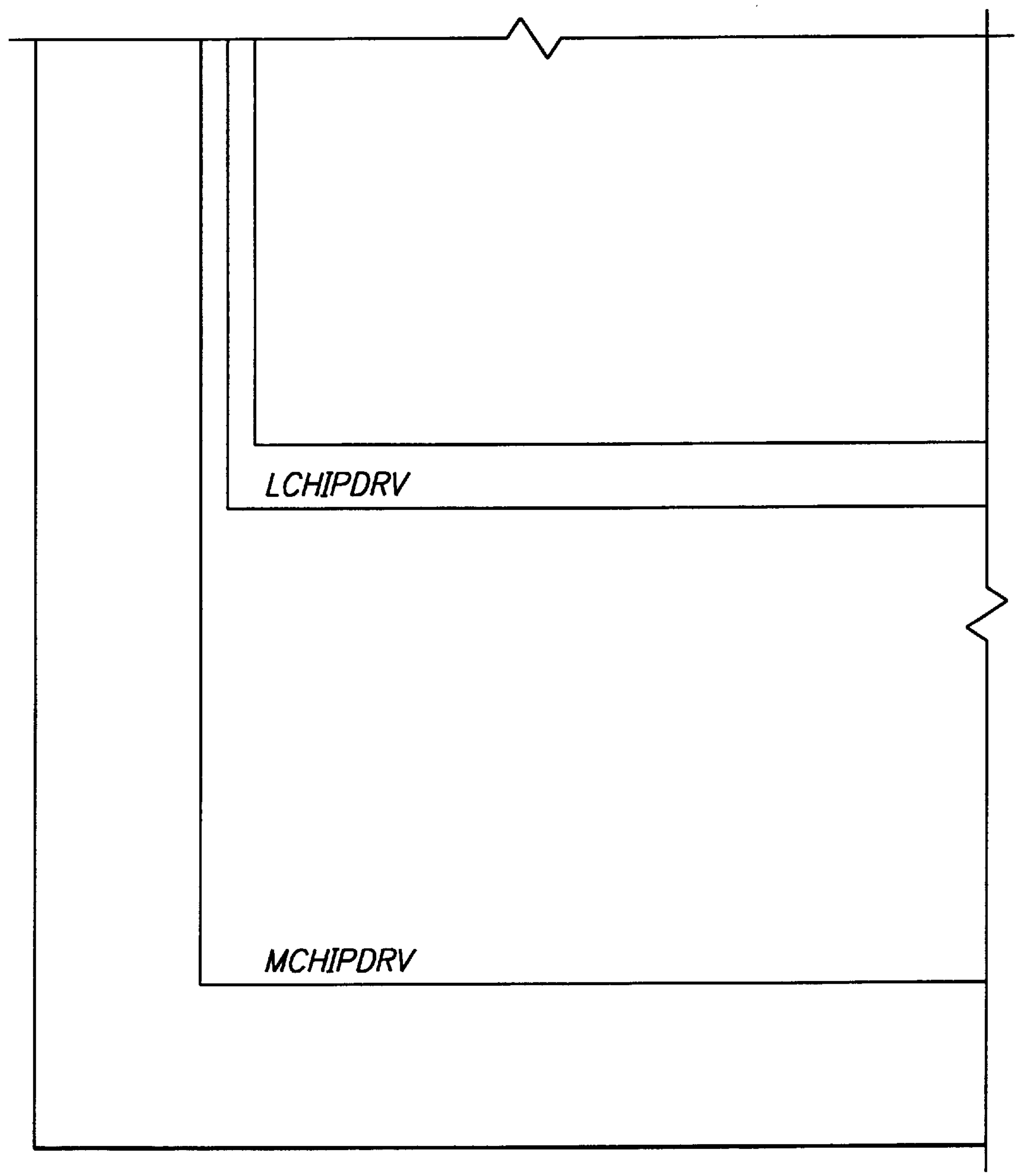
FIG. 10.04CA

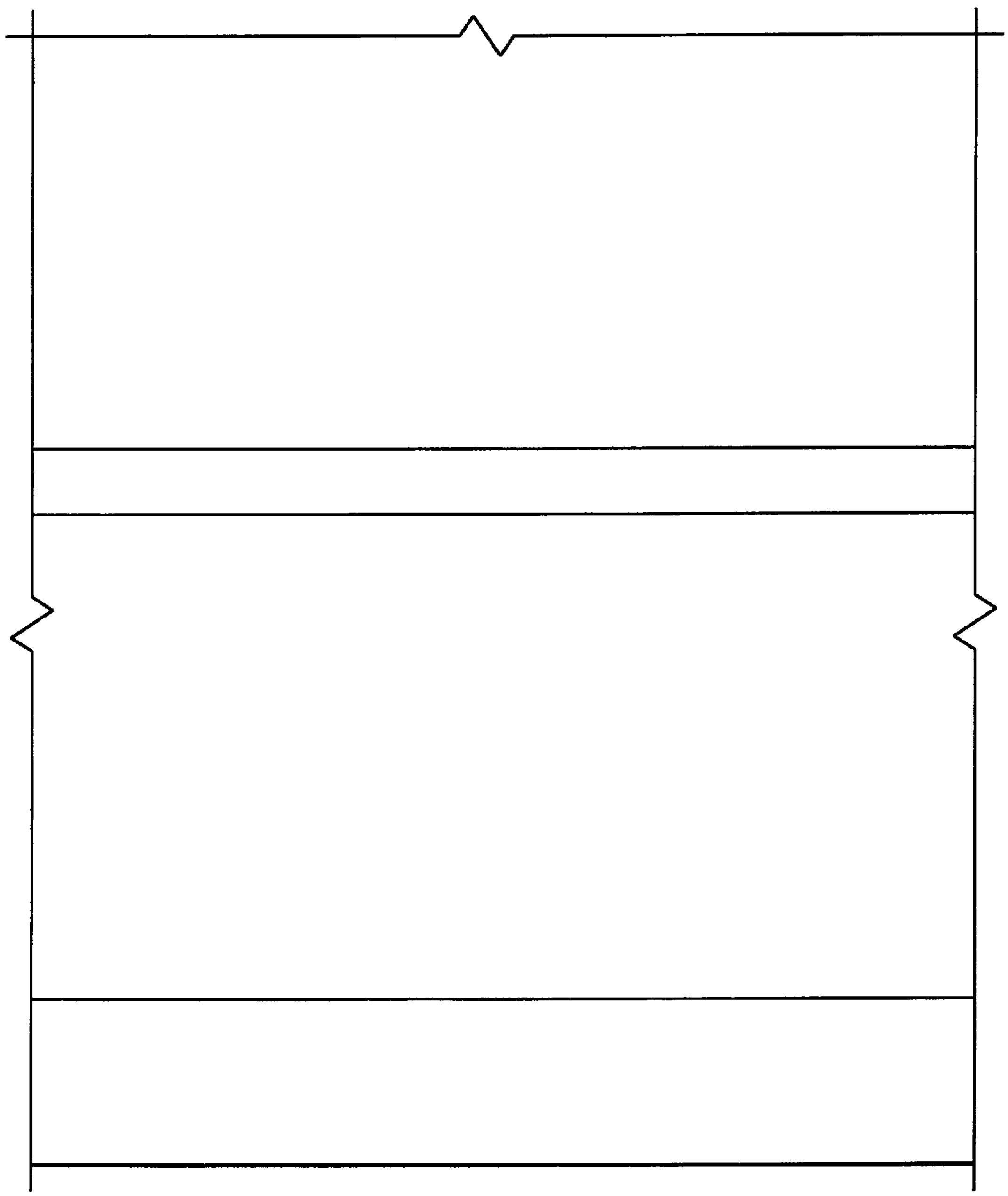
Fig 10.04CB

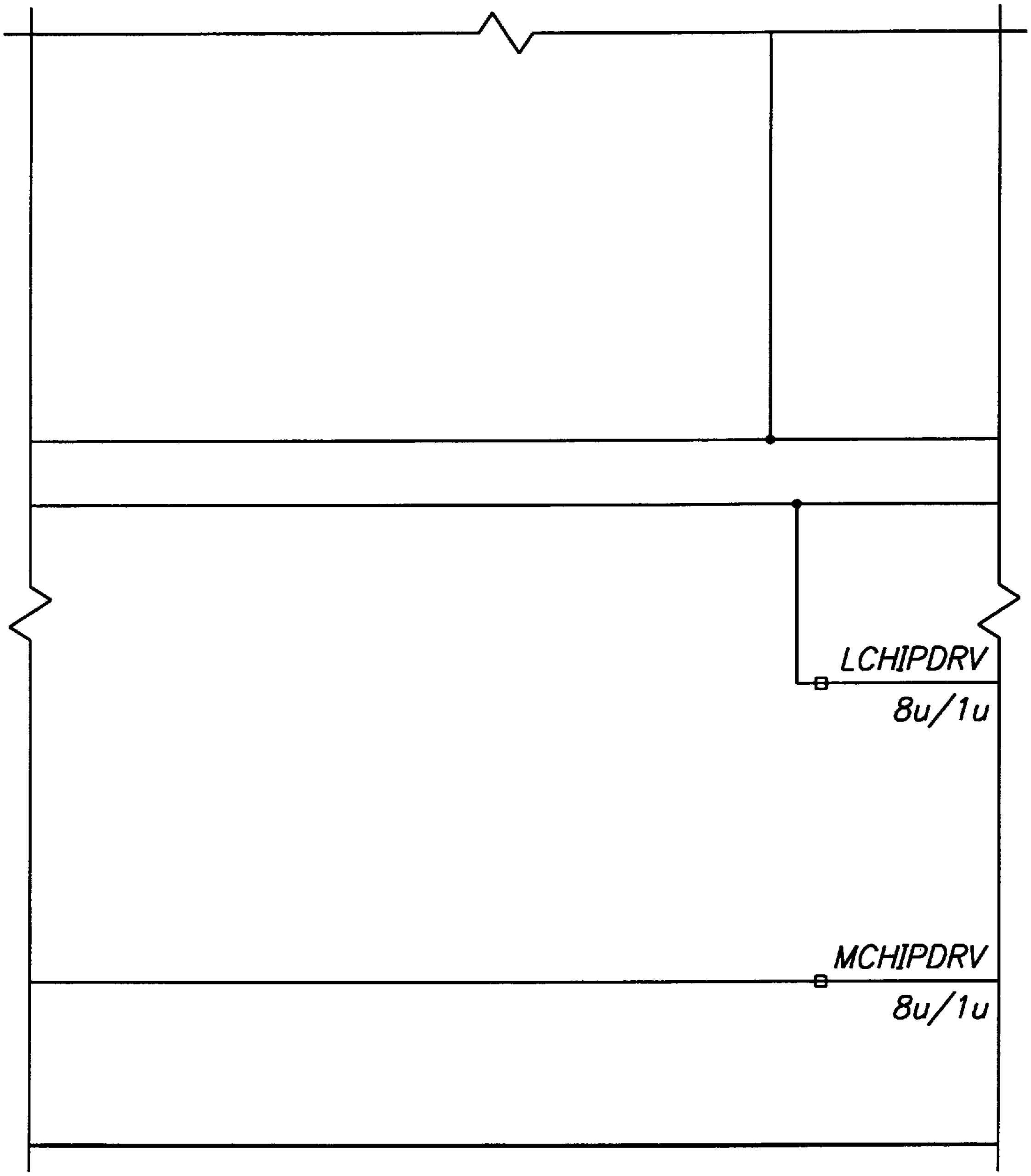
Fig. 10.04CC

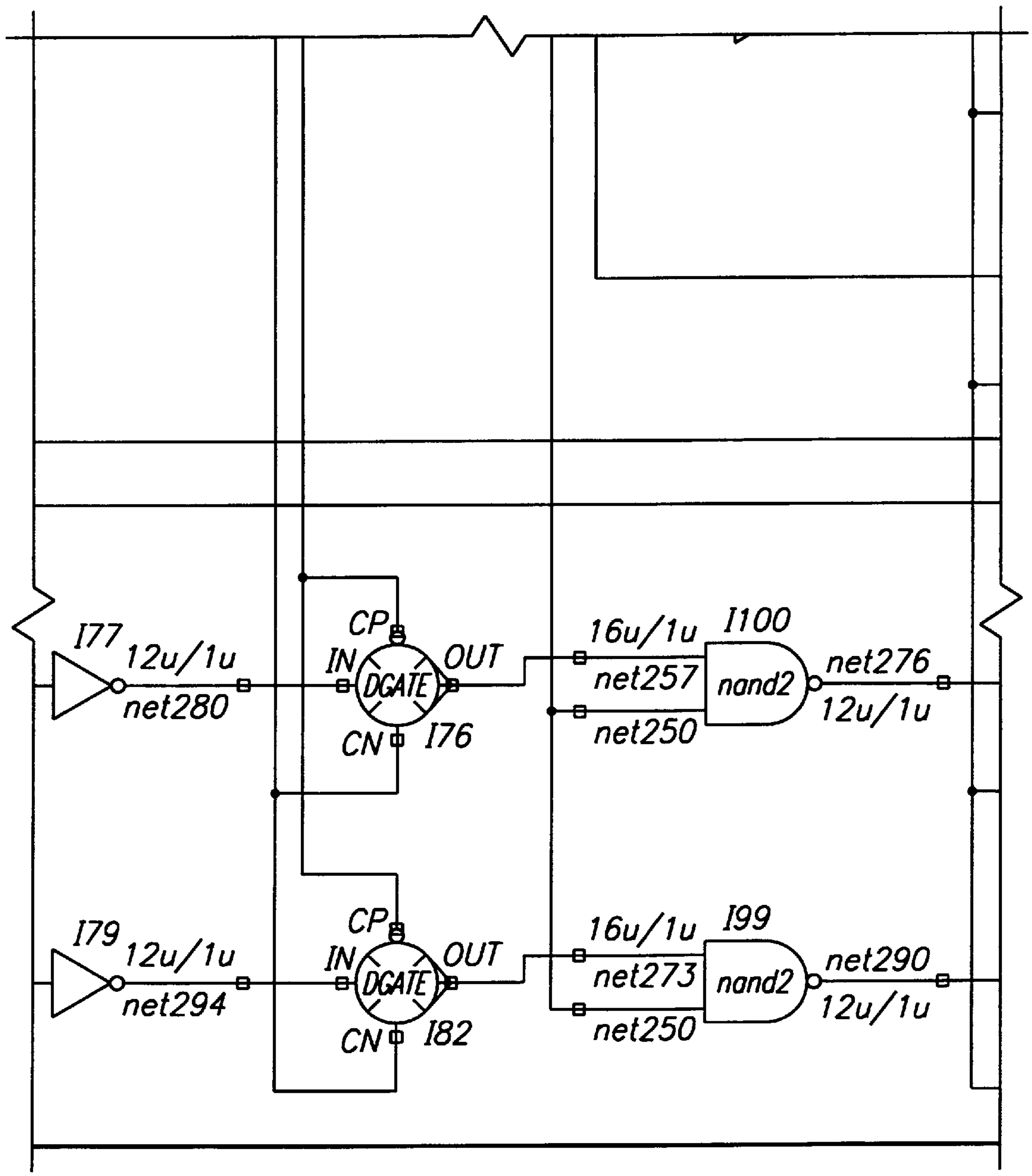
Fig 10.04CD

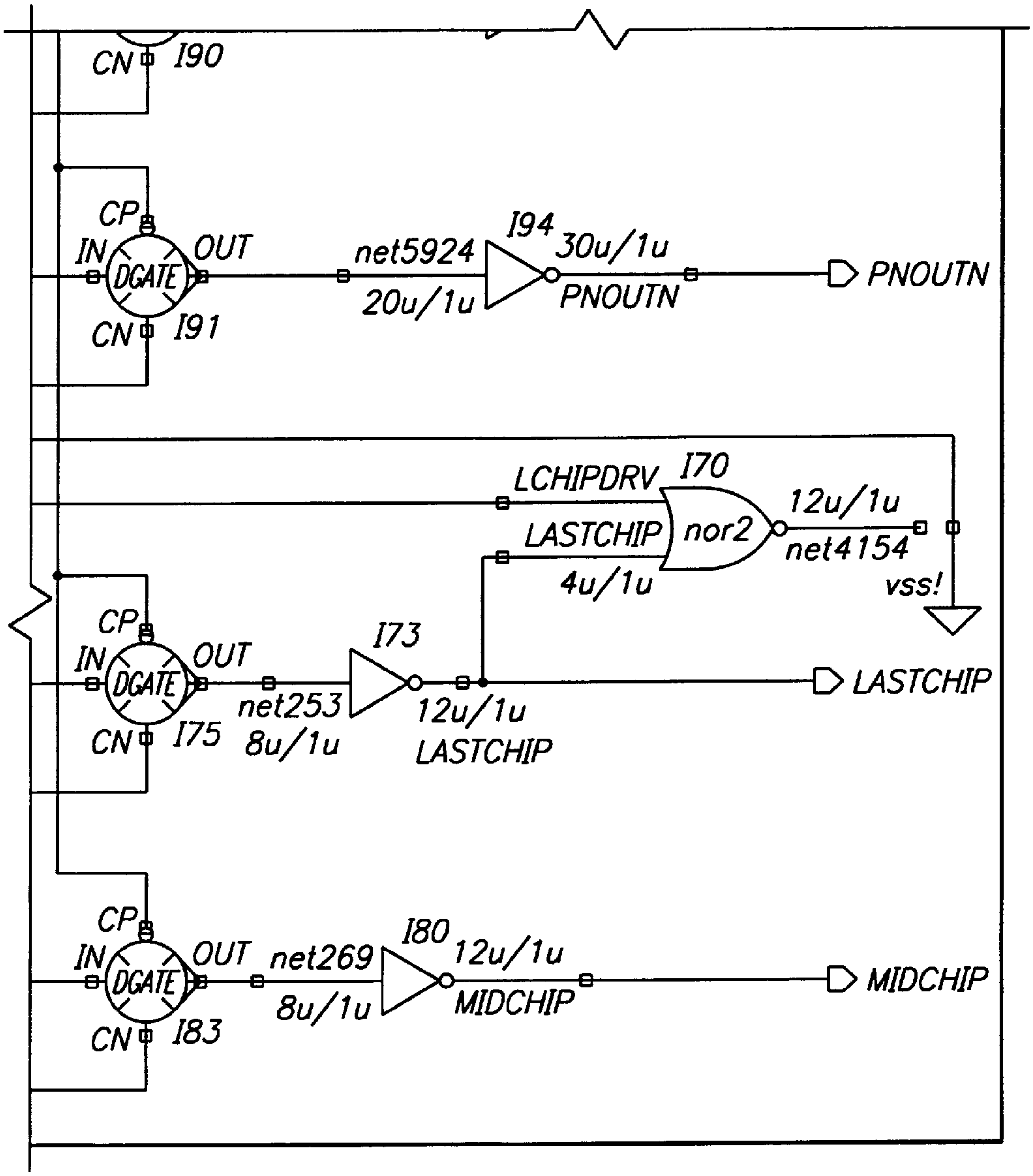
FIG. 10.04CE

| | |
|---|---|
| 10.0402AA | 10.0402AB |
| 10.0402BA | 10.0402BB |
| 10.0402CA | 10.0402CB |

Fig. 10.0402

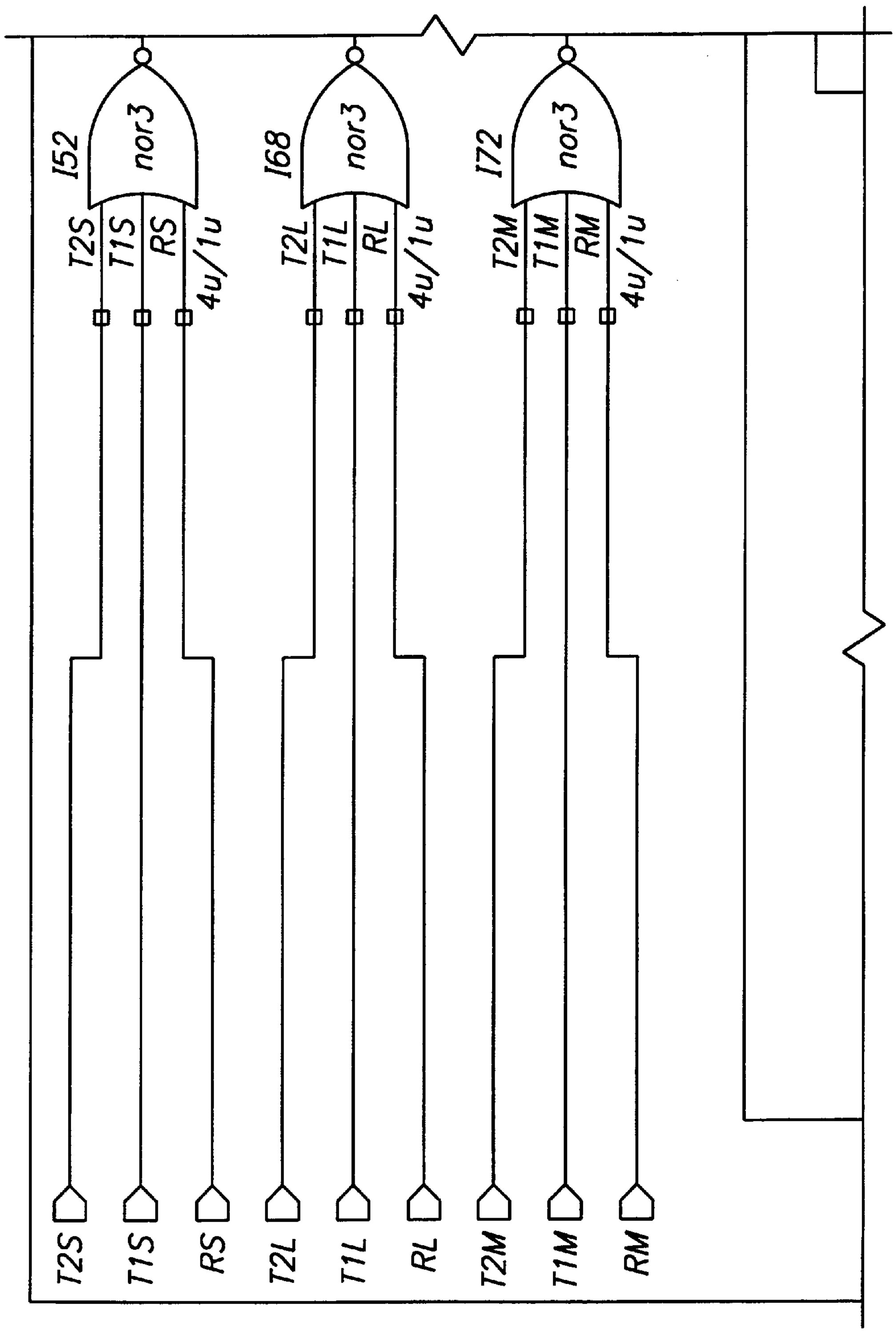
FIG. 10.07AA

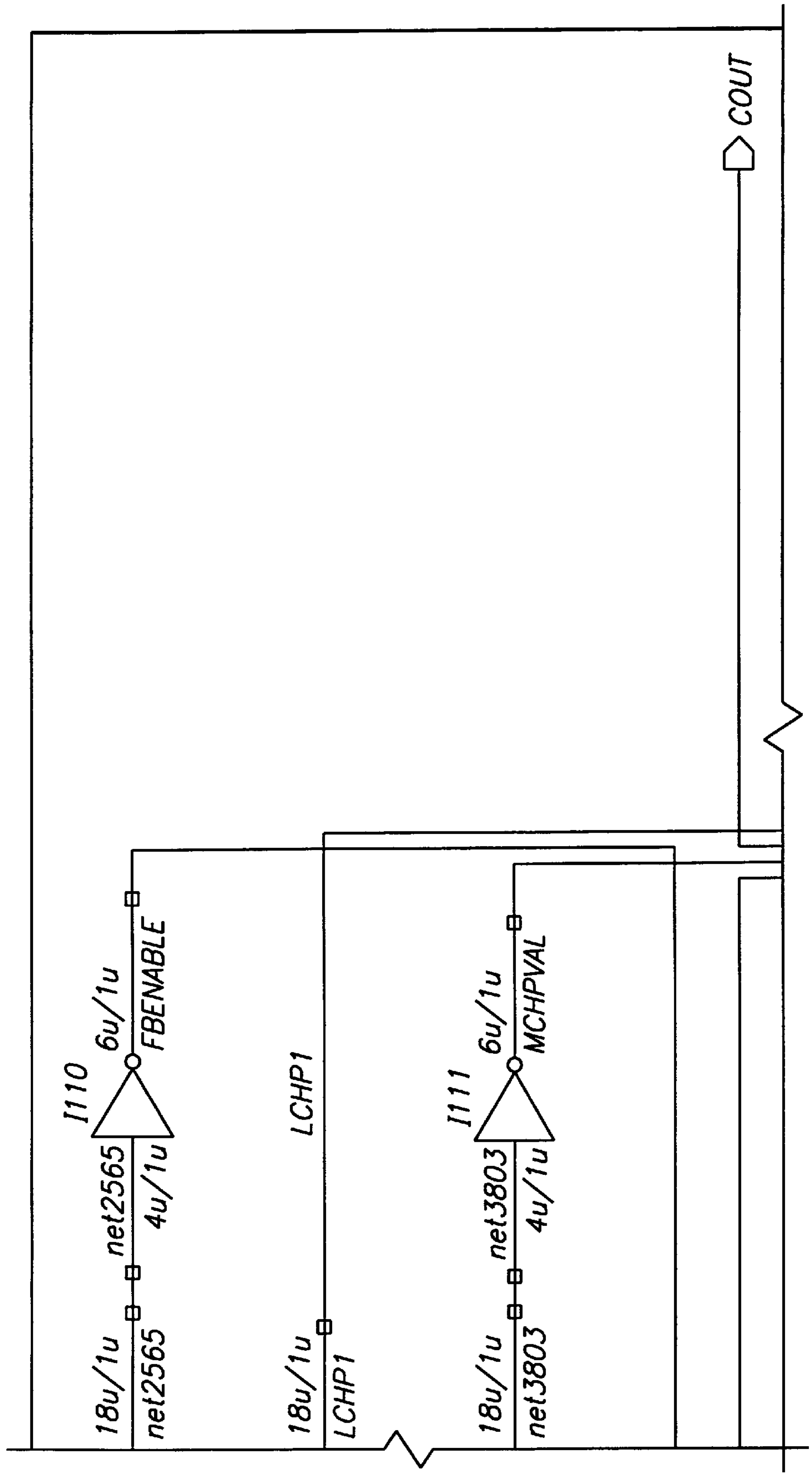
Fig. 10.0402AB

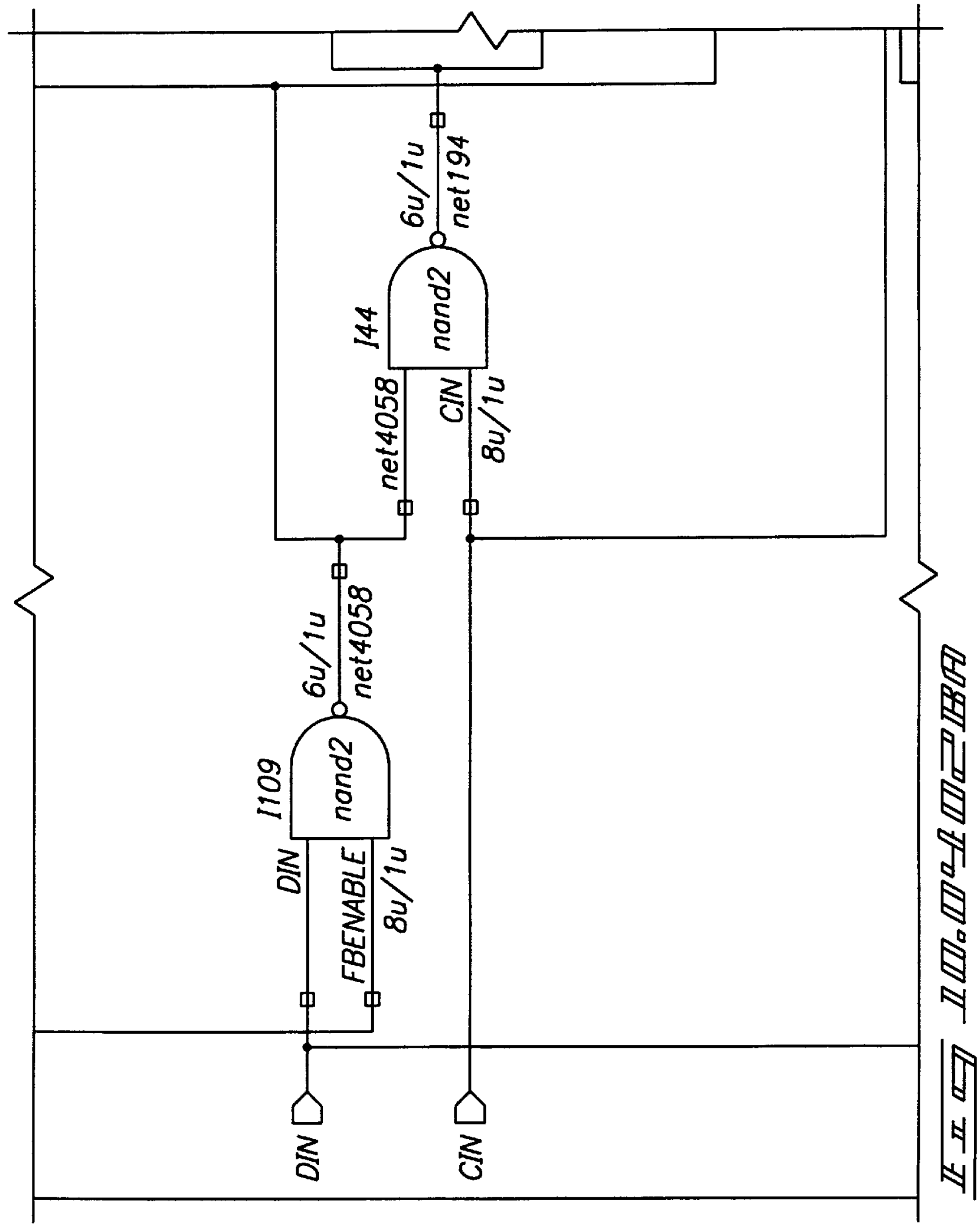
FIG. 10.0402BA

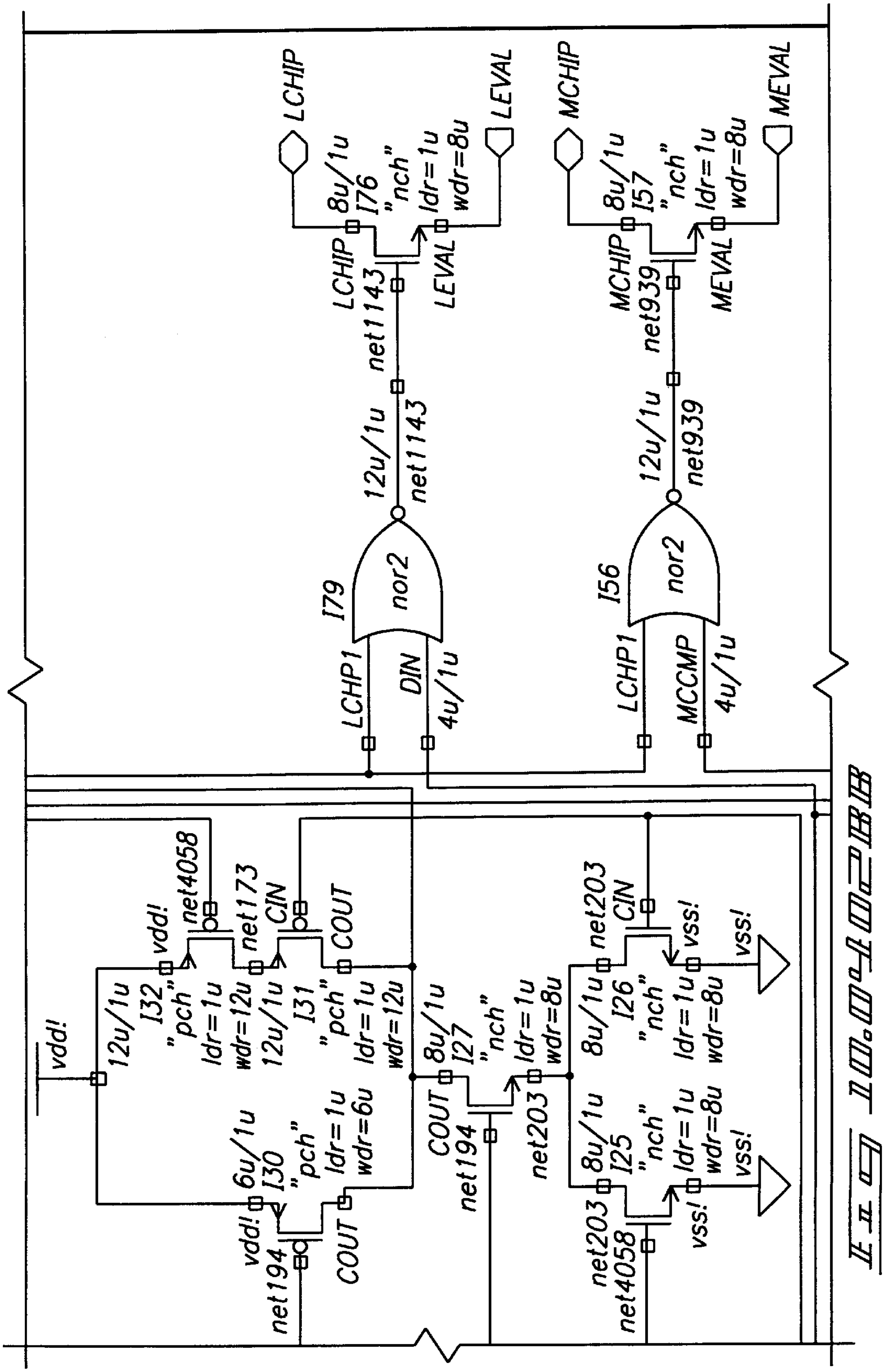
FIG. 10.0042BB

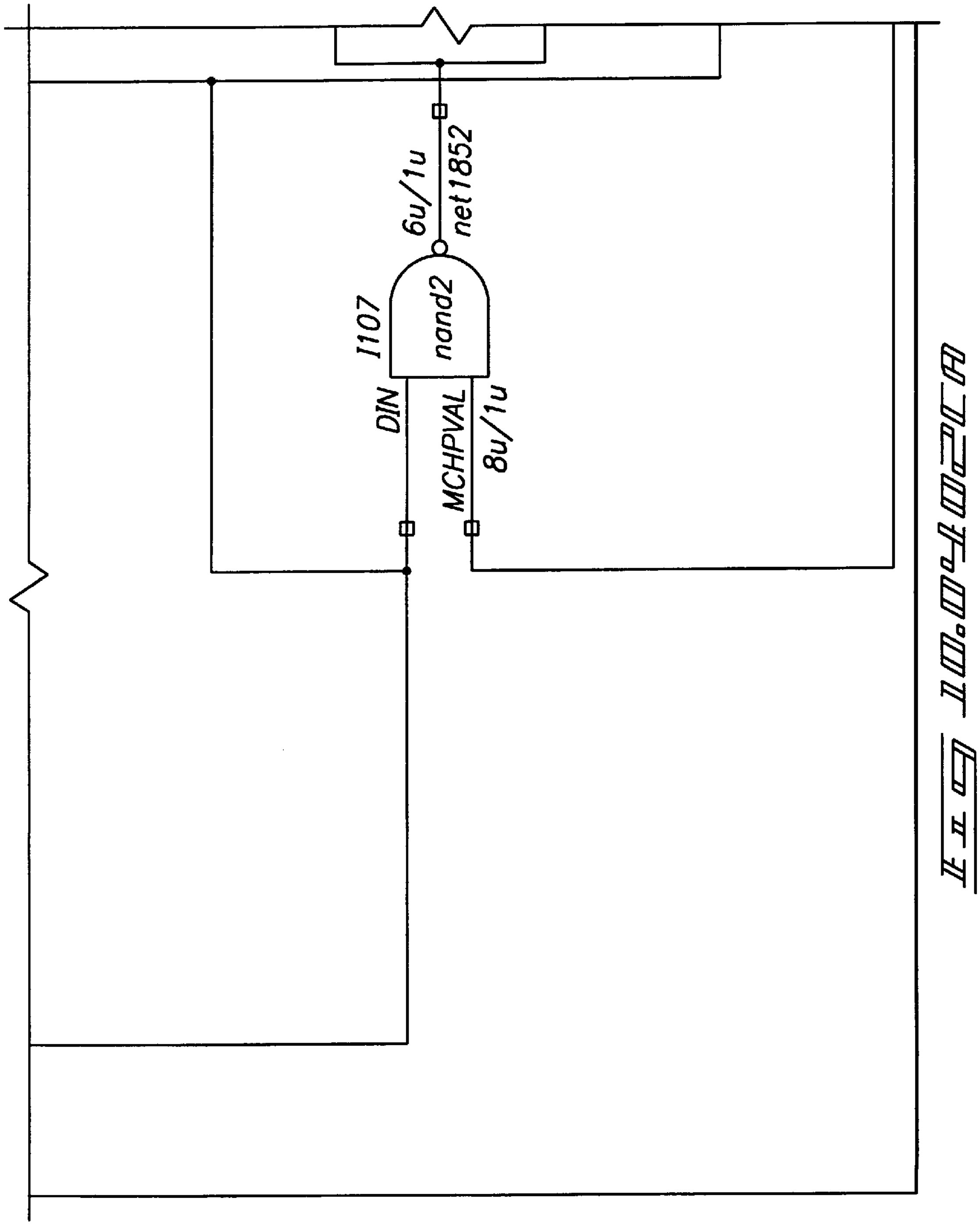
FIG. 10.0402CA

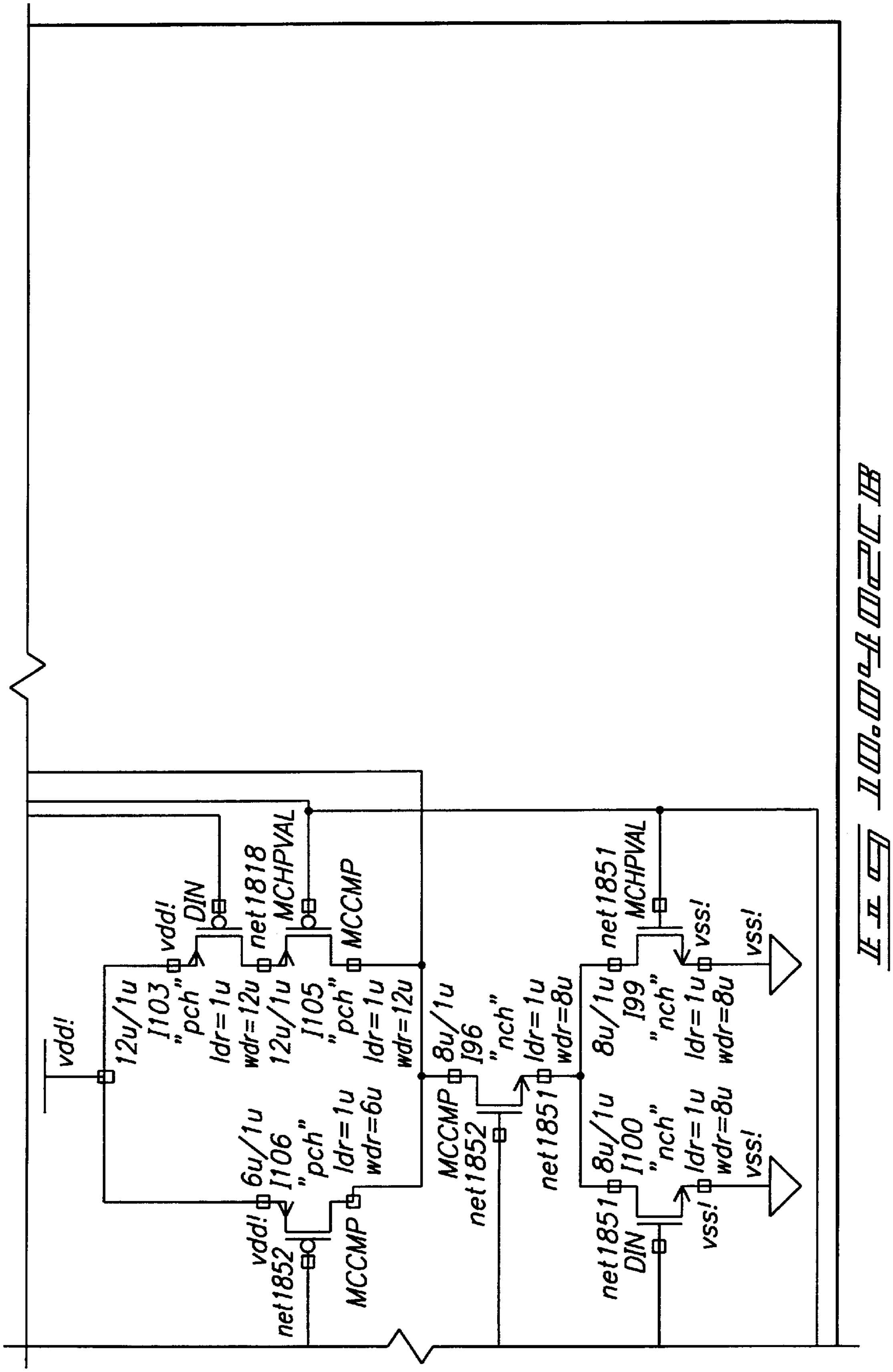
Fig. 10.04.02C.B

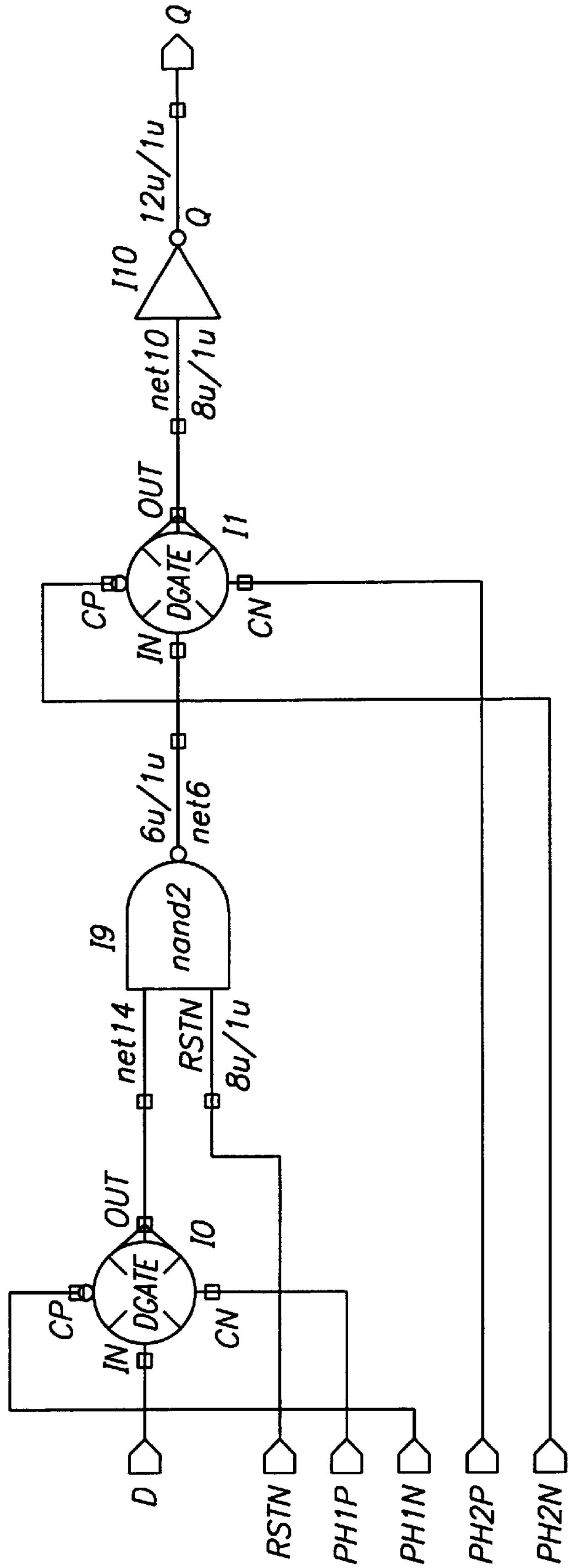
Fig 10.05

| | | | | | | | | | | |
|---|---|---|---|---|---|---|---|---|---|---|
| 10.06AA | 10.06AB | 10.06AC | 10.06AD | | | | | | | |
| 10.06BA | 10.06BB | 10.06BC | 10.06BD | 10.06BE | 10.06BF | 10.06BG | 10.06BH | 10.06BI | 10.06BJ | 10.06BK |
| 10.06CA | 10.06CB | 10.06CC | 10.06CD | 10.06CE | 10.06CF | 10.06CG | 10.06CH | 10.06CI | 10.06CJ | 10.06CK |
| 10.06DA | 10.06DB | 10.06DC | 10.06DD | 10.06DE | 10.06DF | 10.06DG | 10.06DH | | | |

Fig 10.06

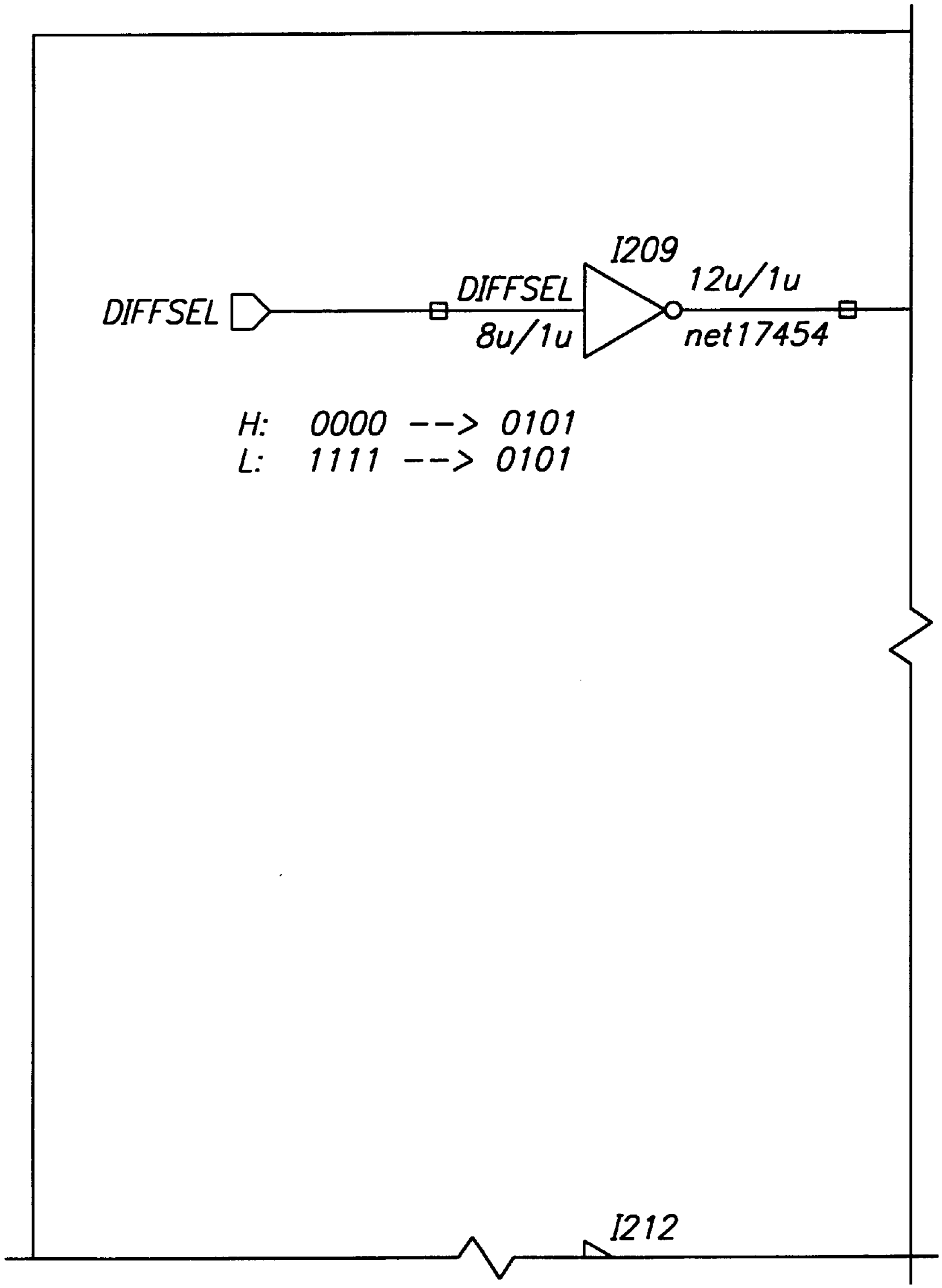
Fig 10.06AA

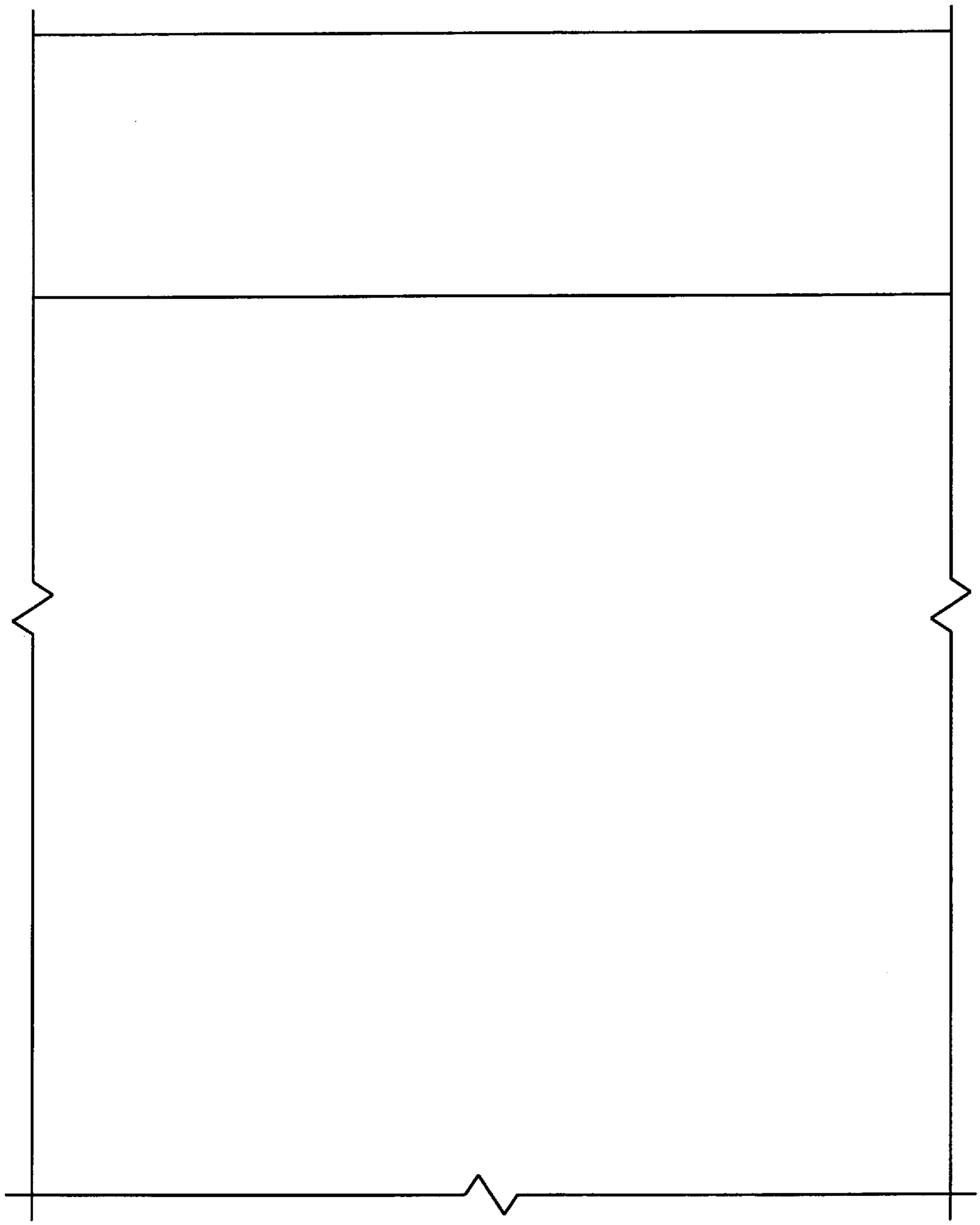
Fig 10.06AB

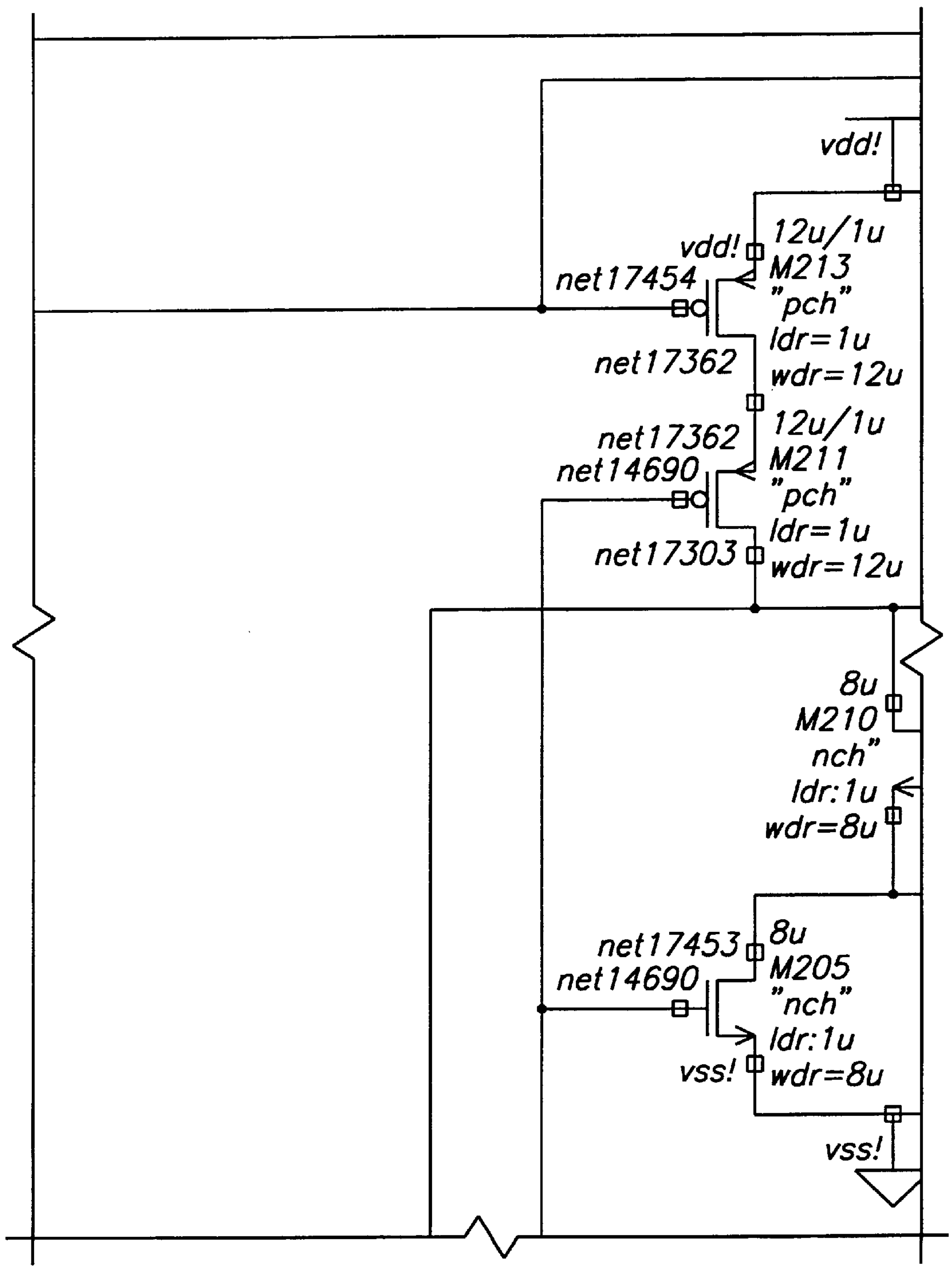
Fig 10.06AC

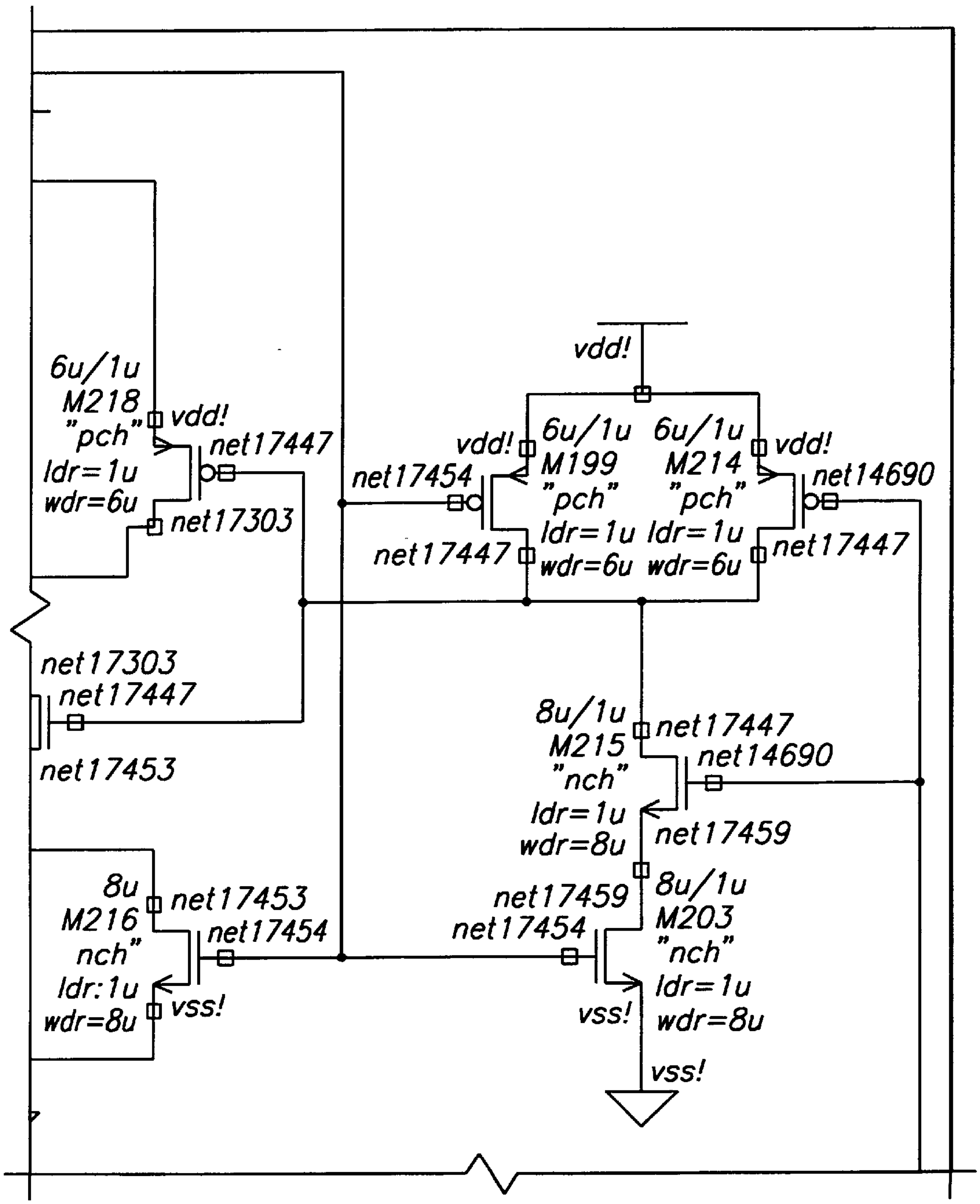
FIG. 10.06AD

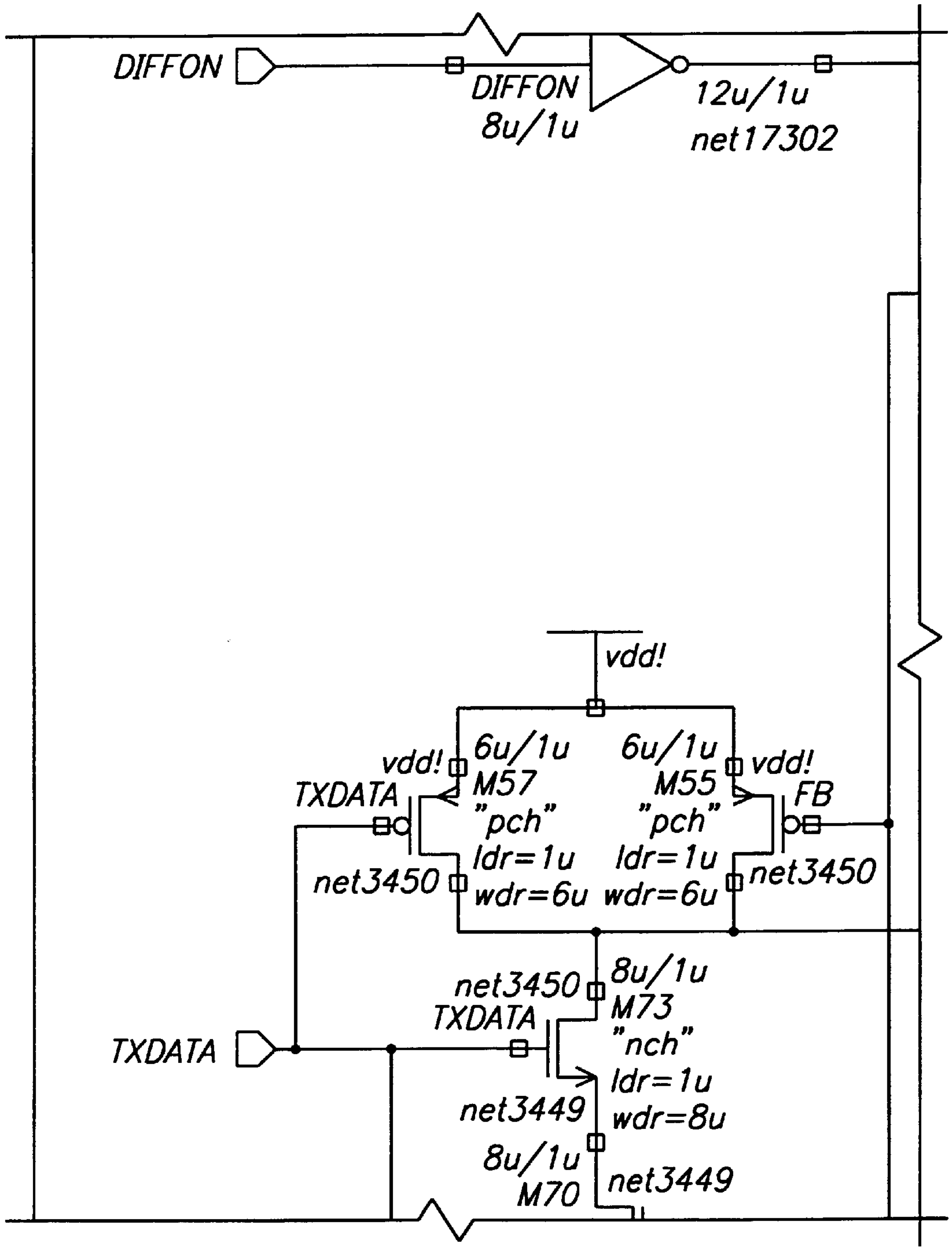
Fig 10.06BA

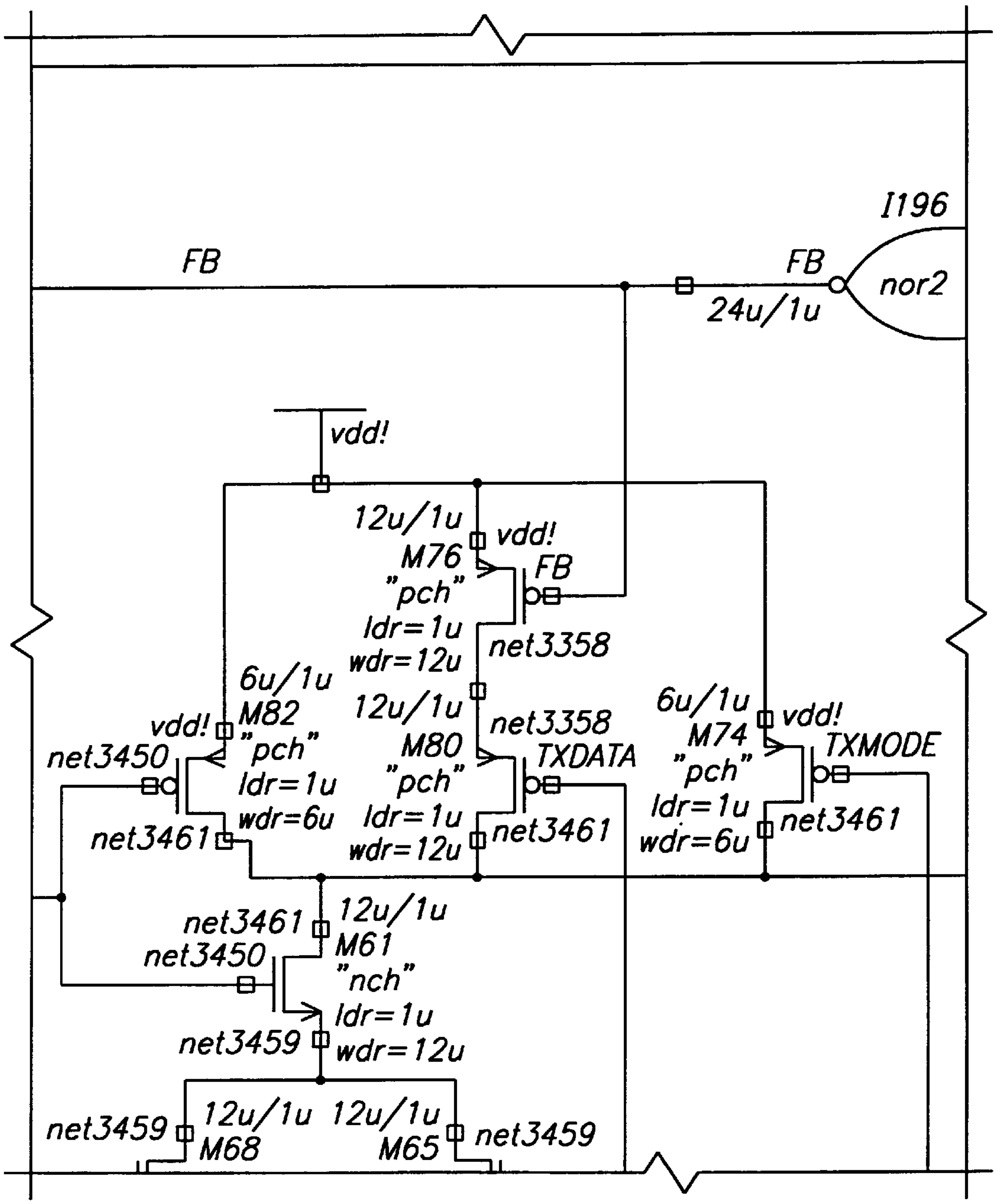
Fig 10.06BB

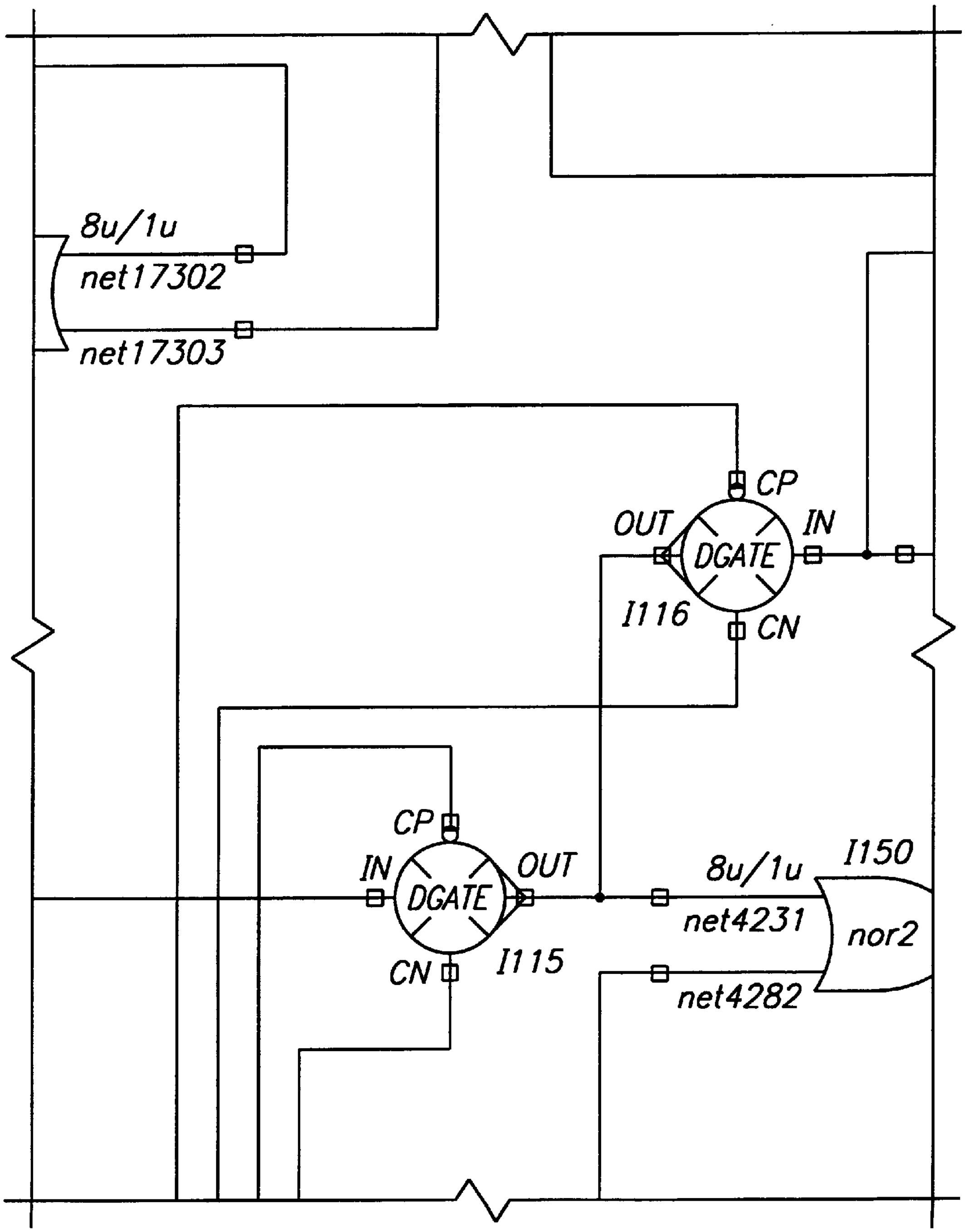
Fig 10.06BC

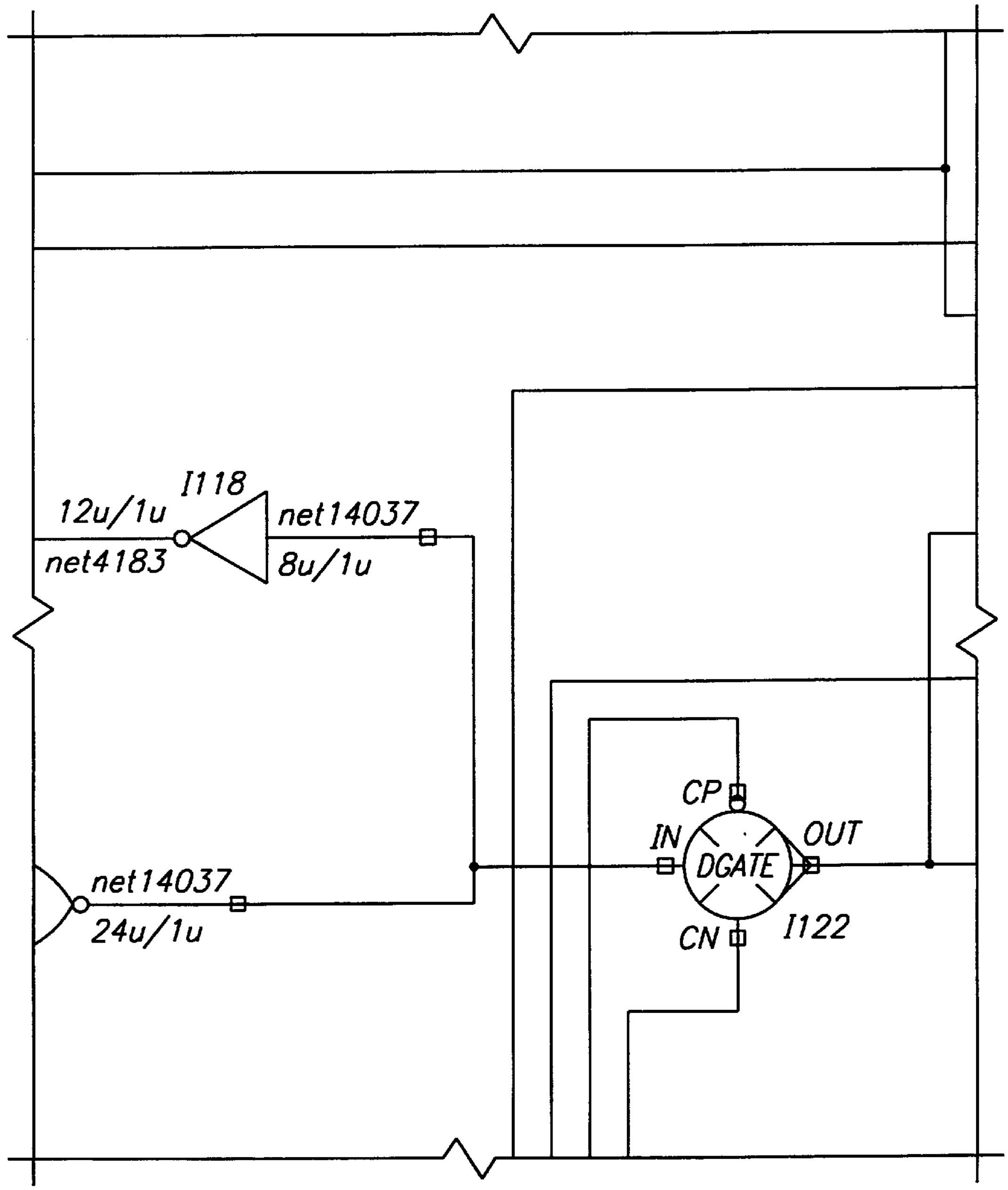
Fig 10.06BD

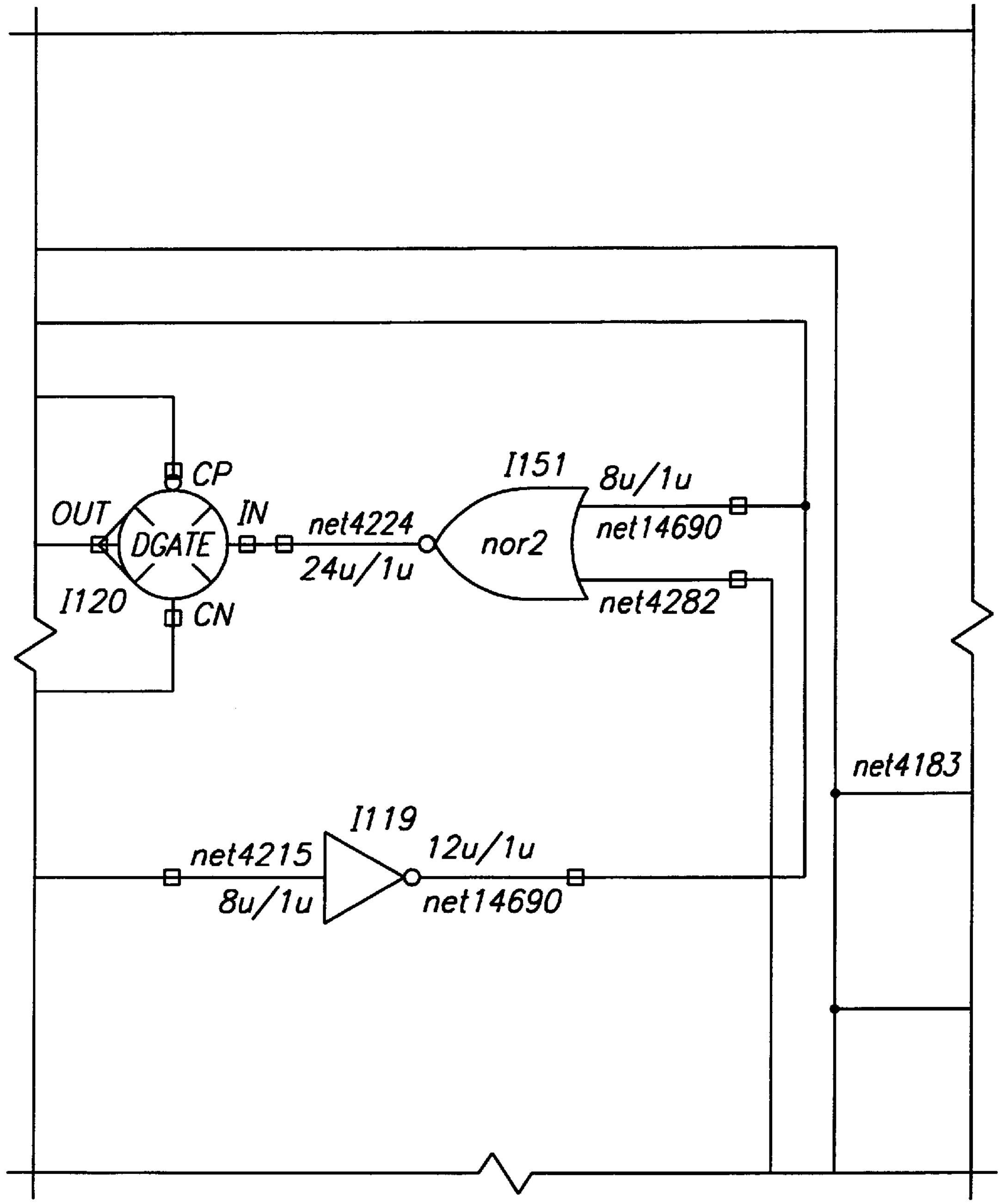
Fig 10.06BE

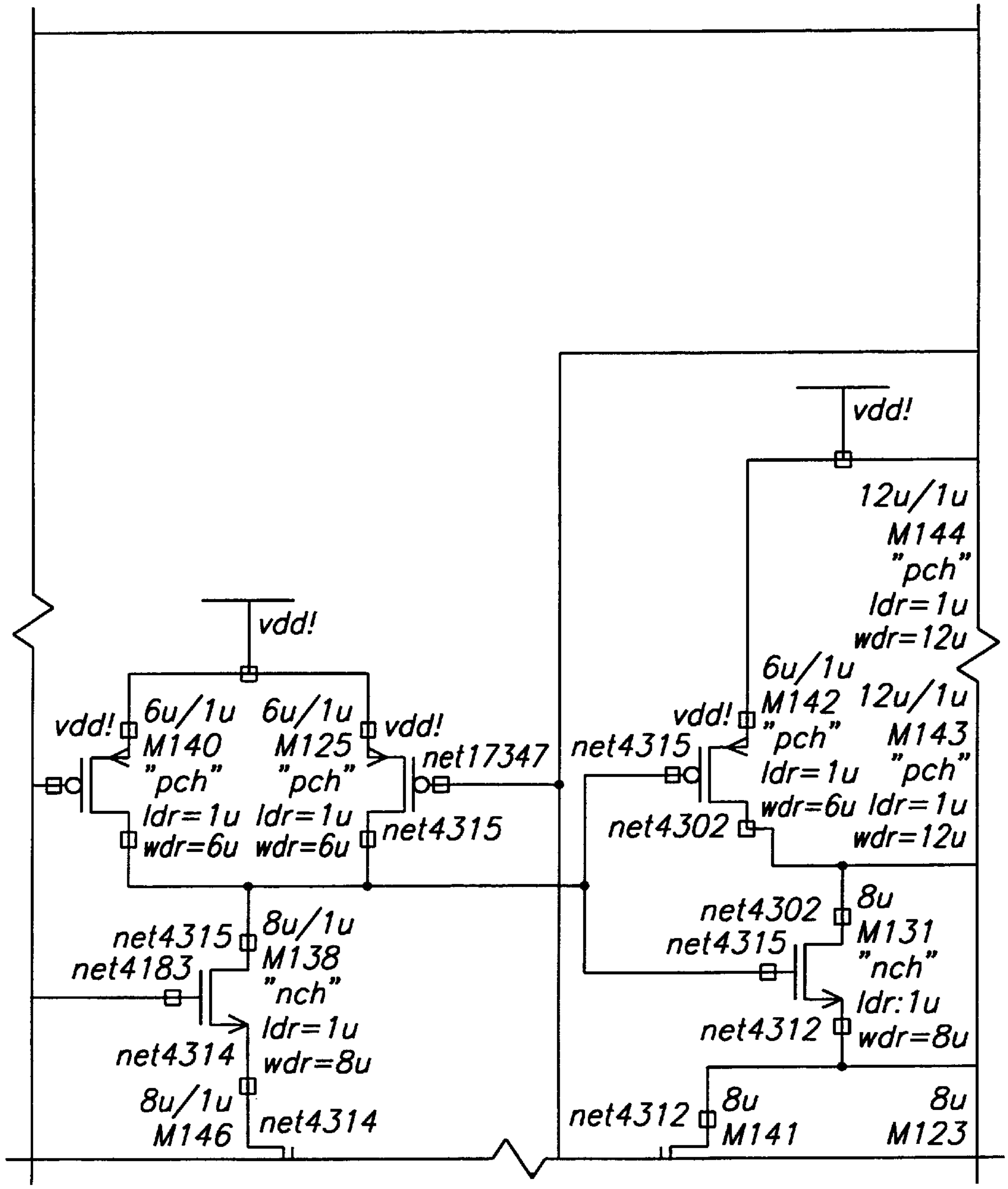
Fig 10.06BF

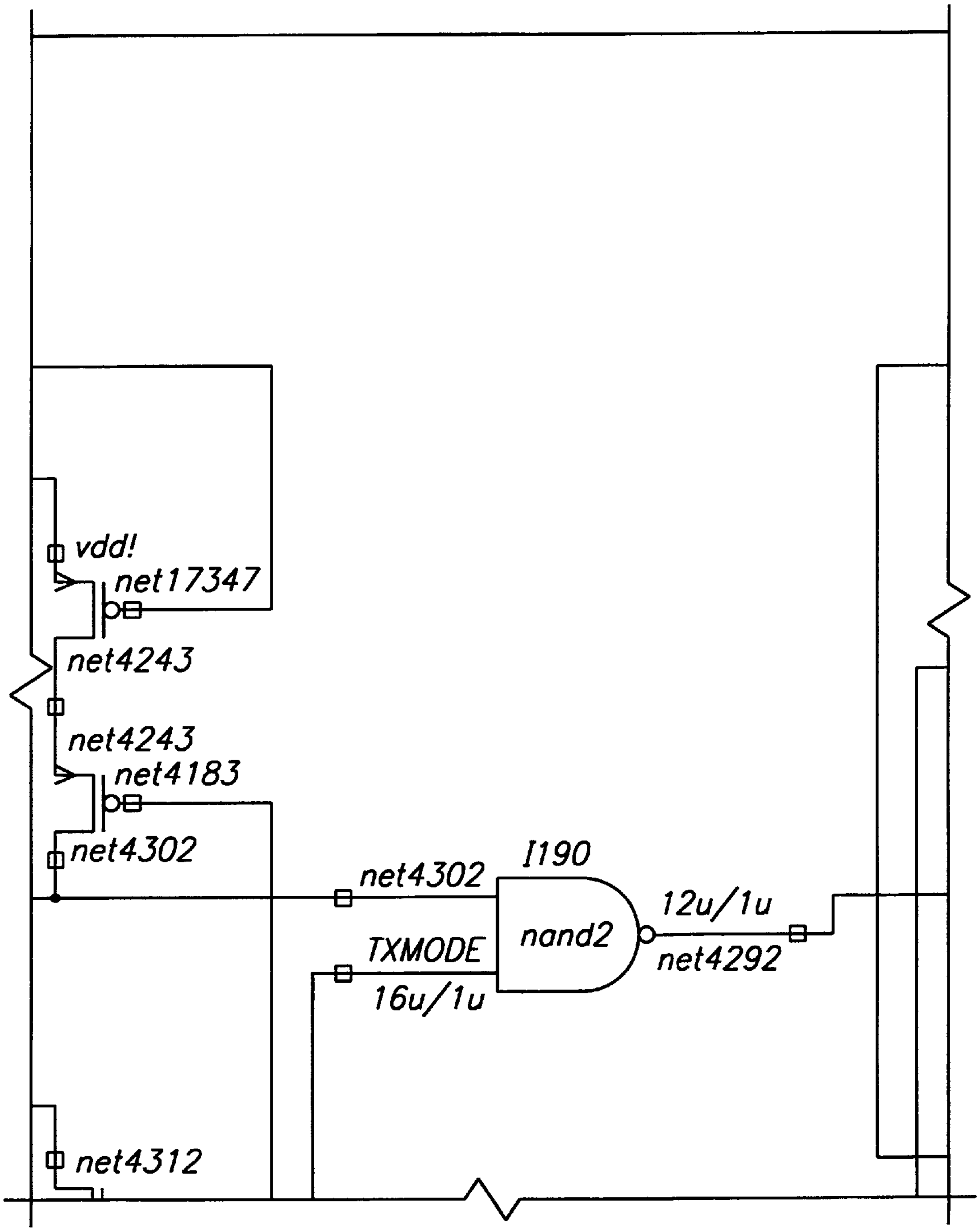
Fig 10.06BG

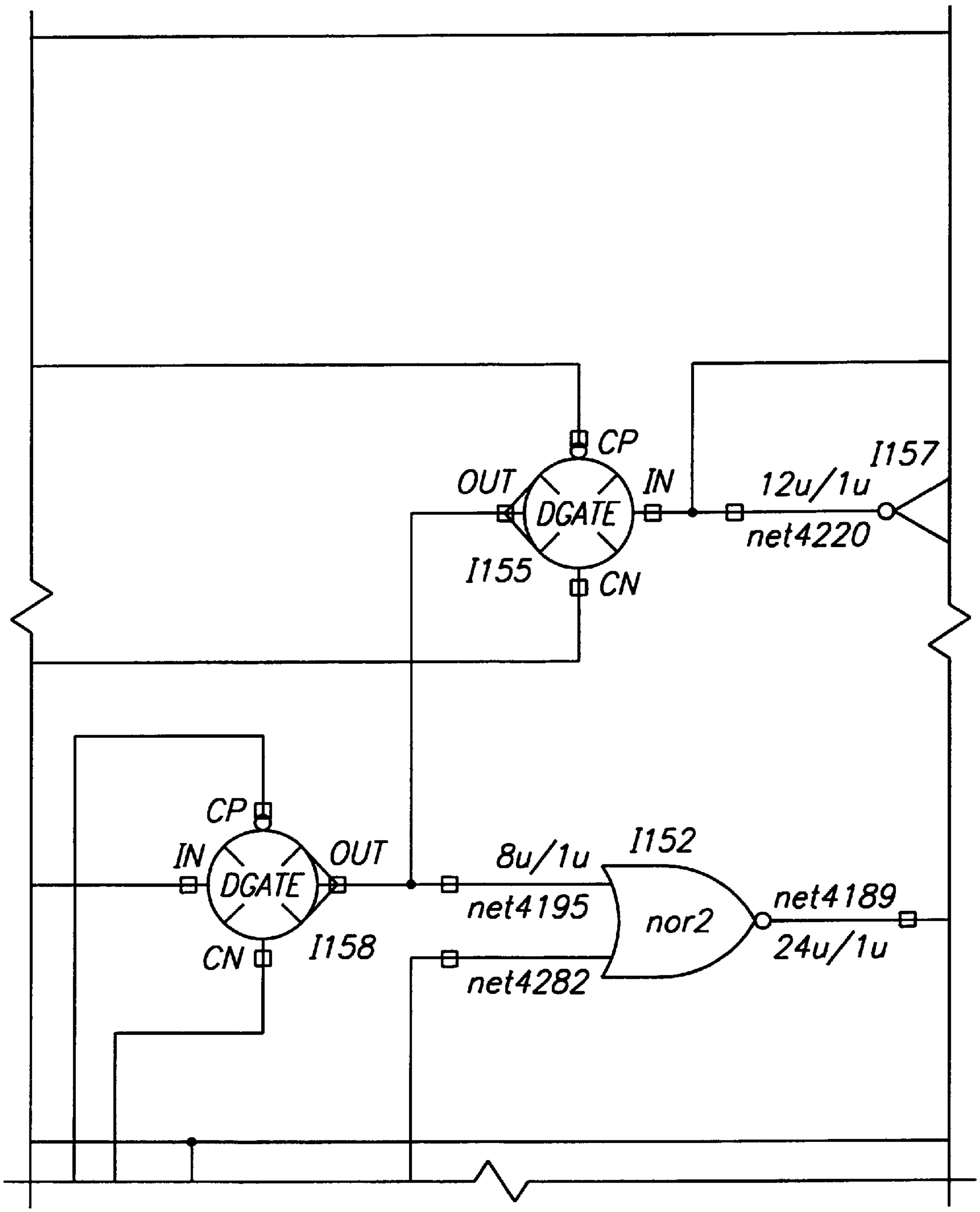
Fig 10.06BH

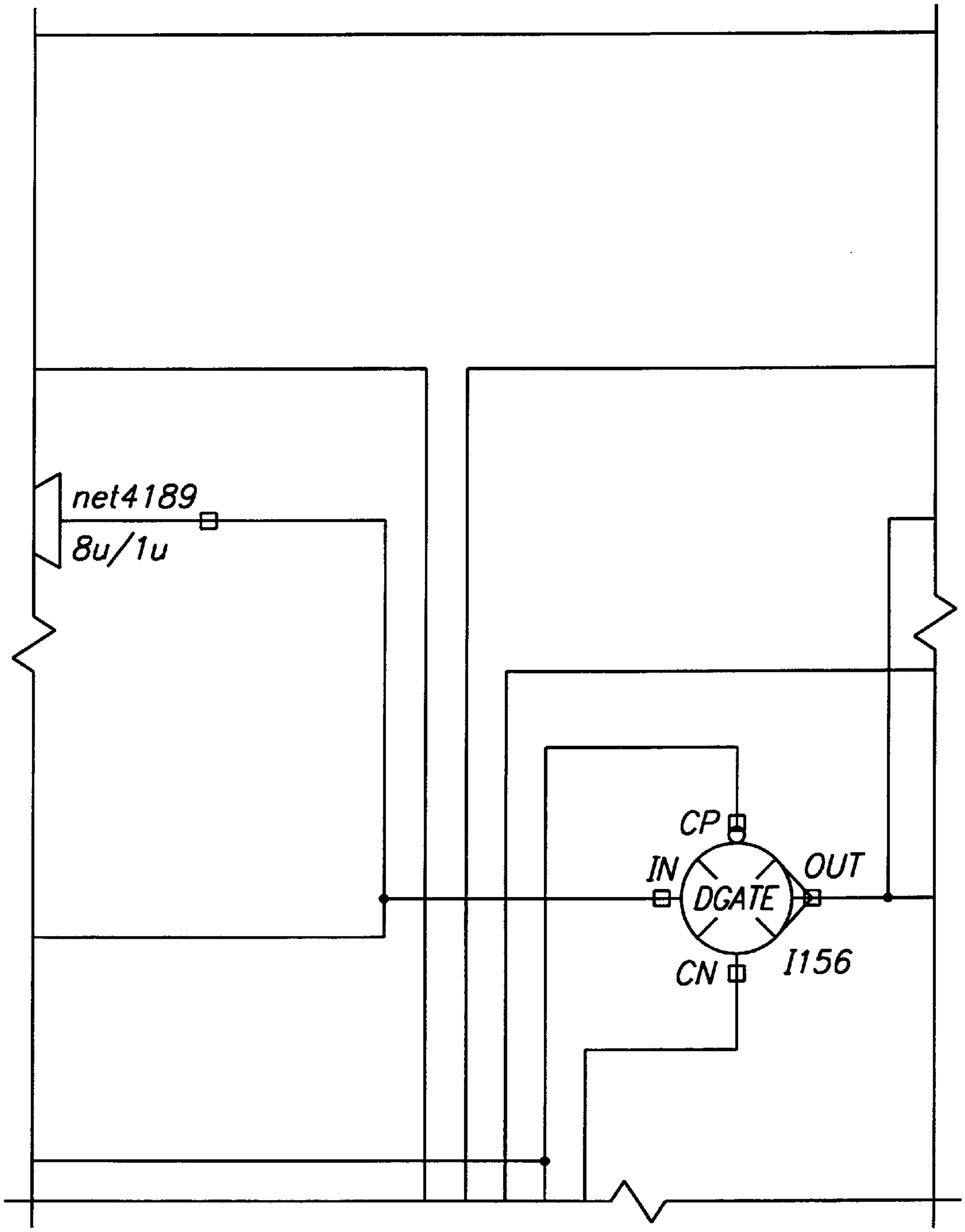
Fig 10.06BI

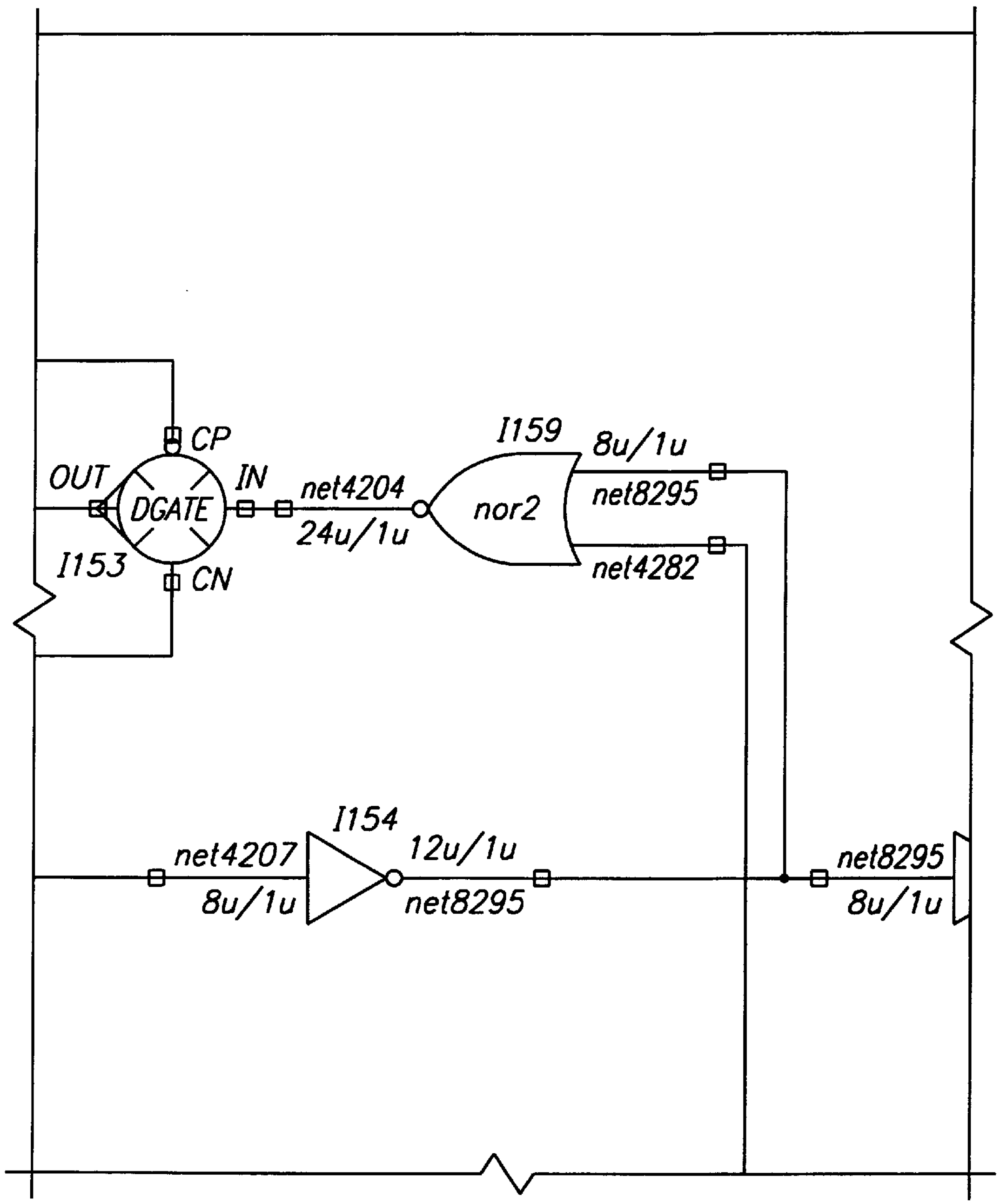
Fig 10.06Ba

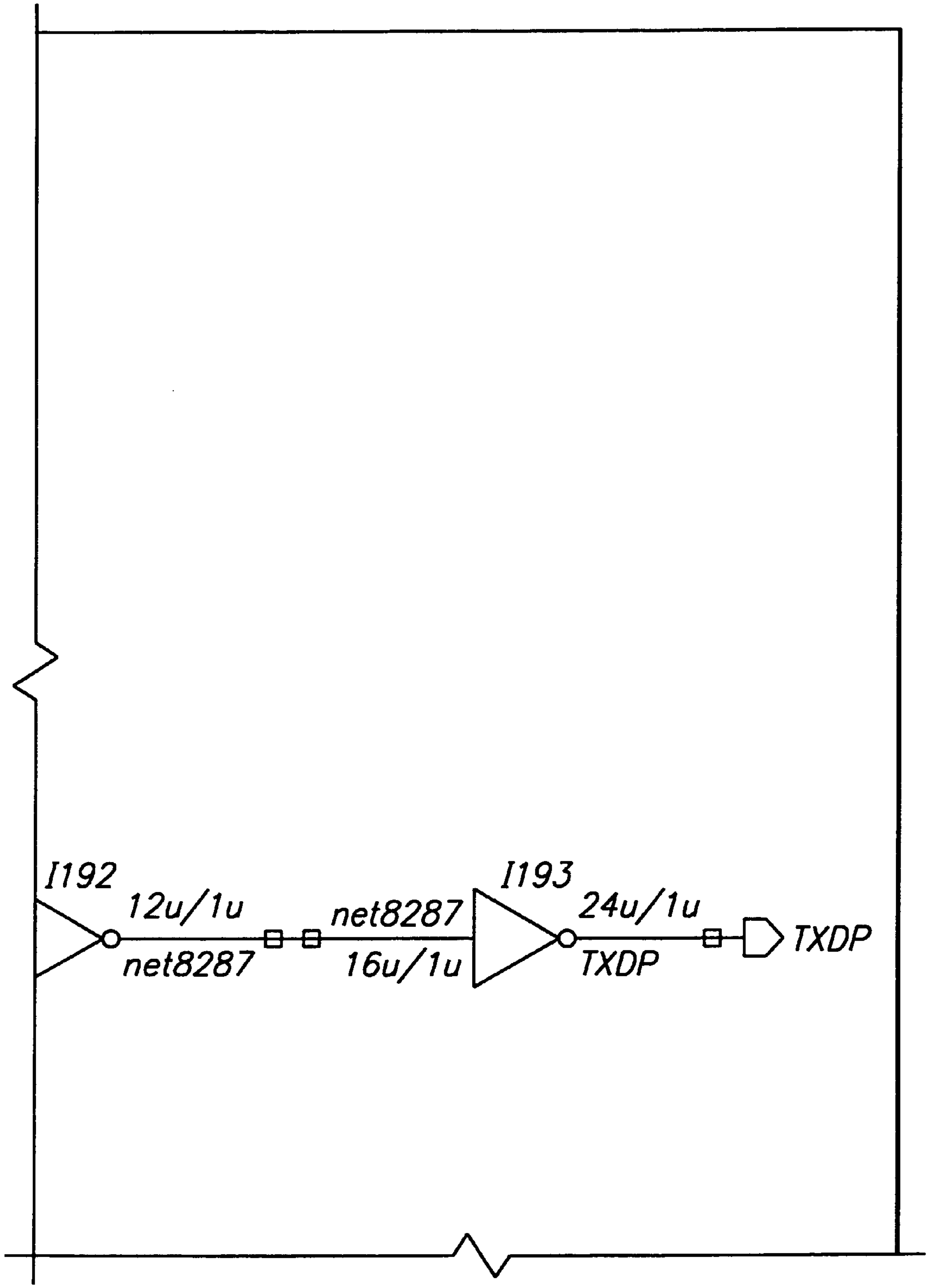
Fig 10.06BK

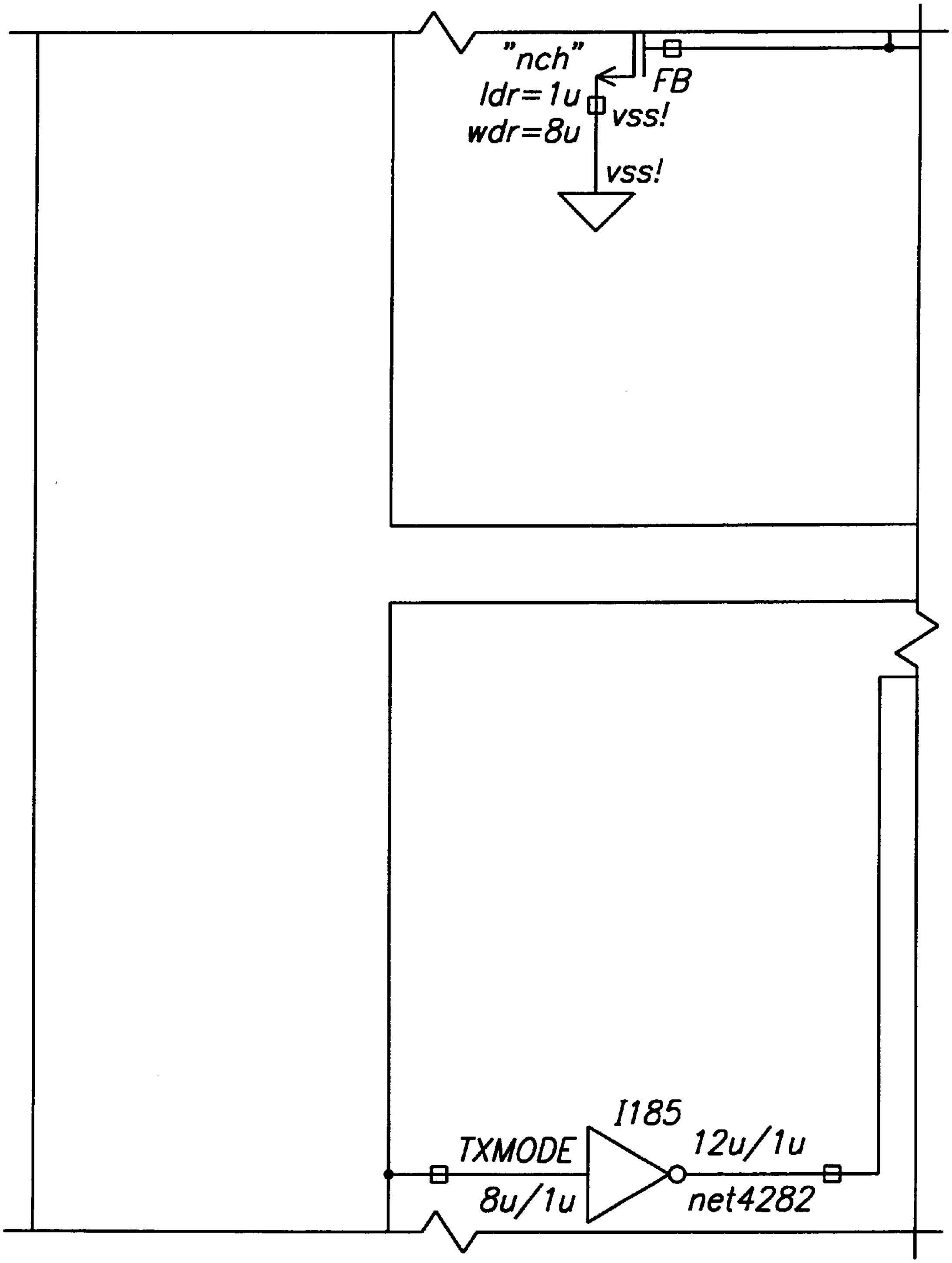
Fig 10.06CA

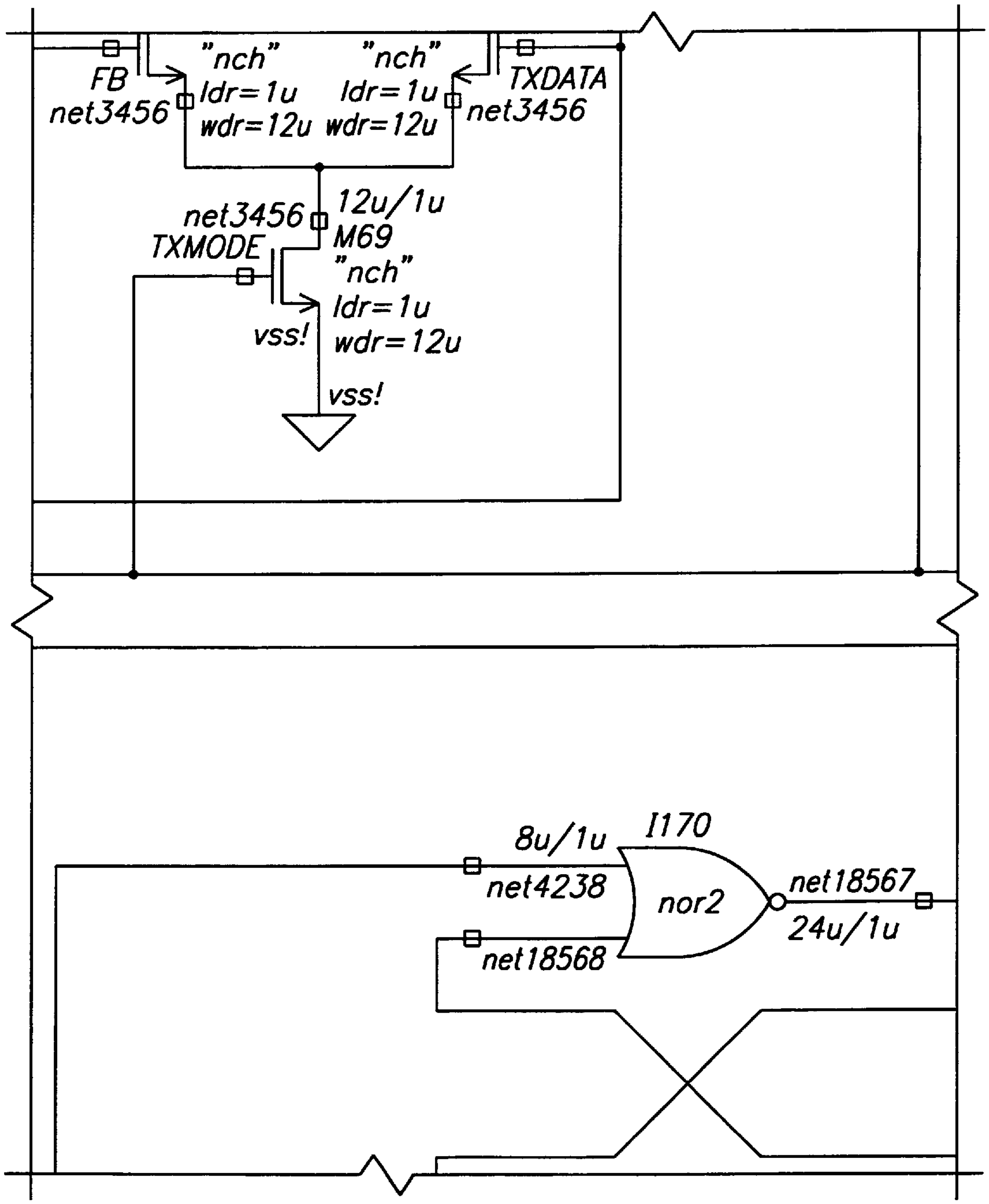
Fig 10.06CB

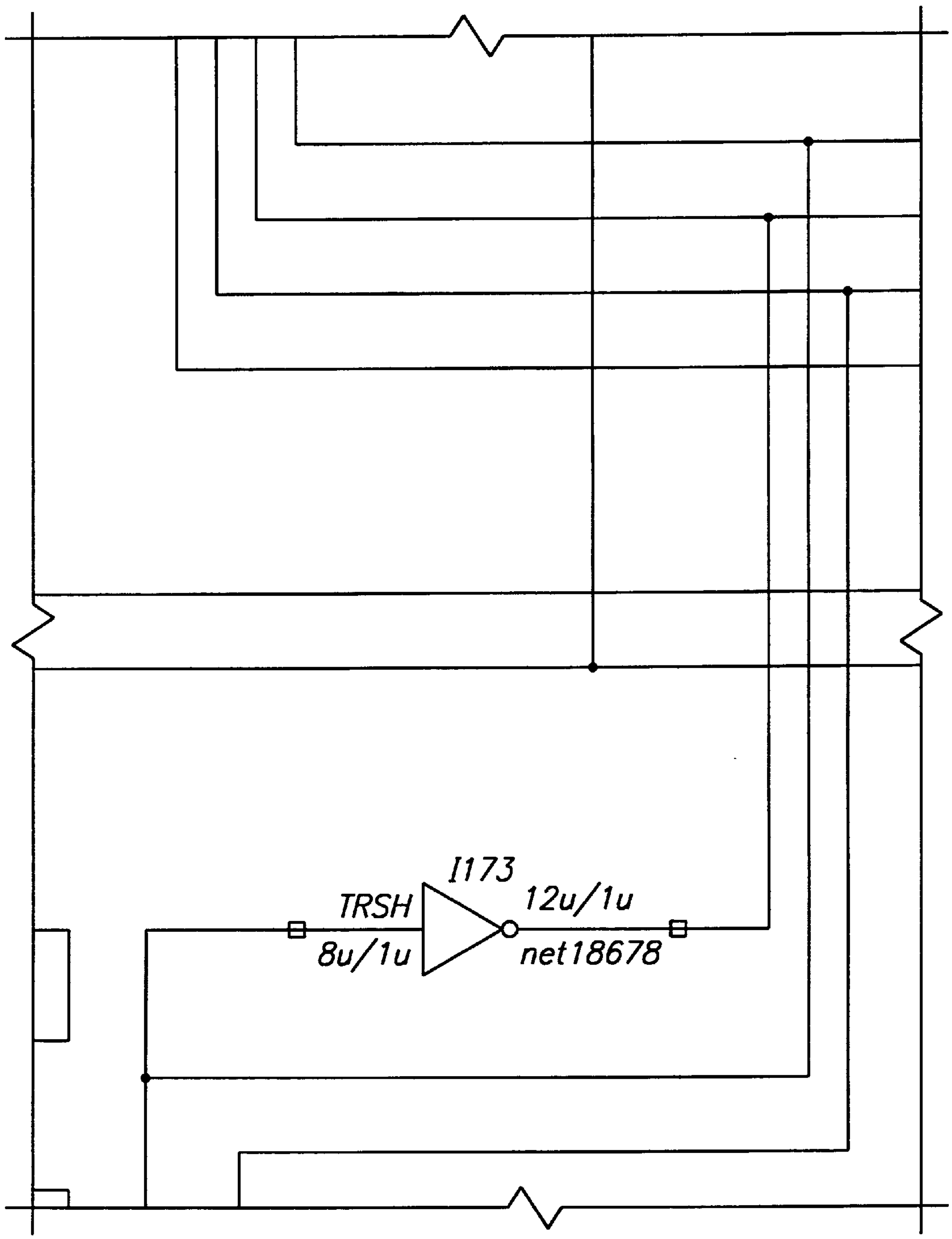
Fig 10.06CC

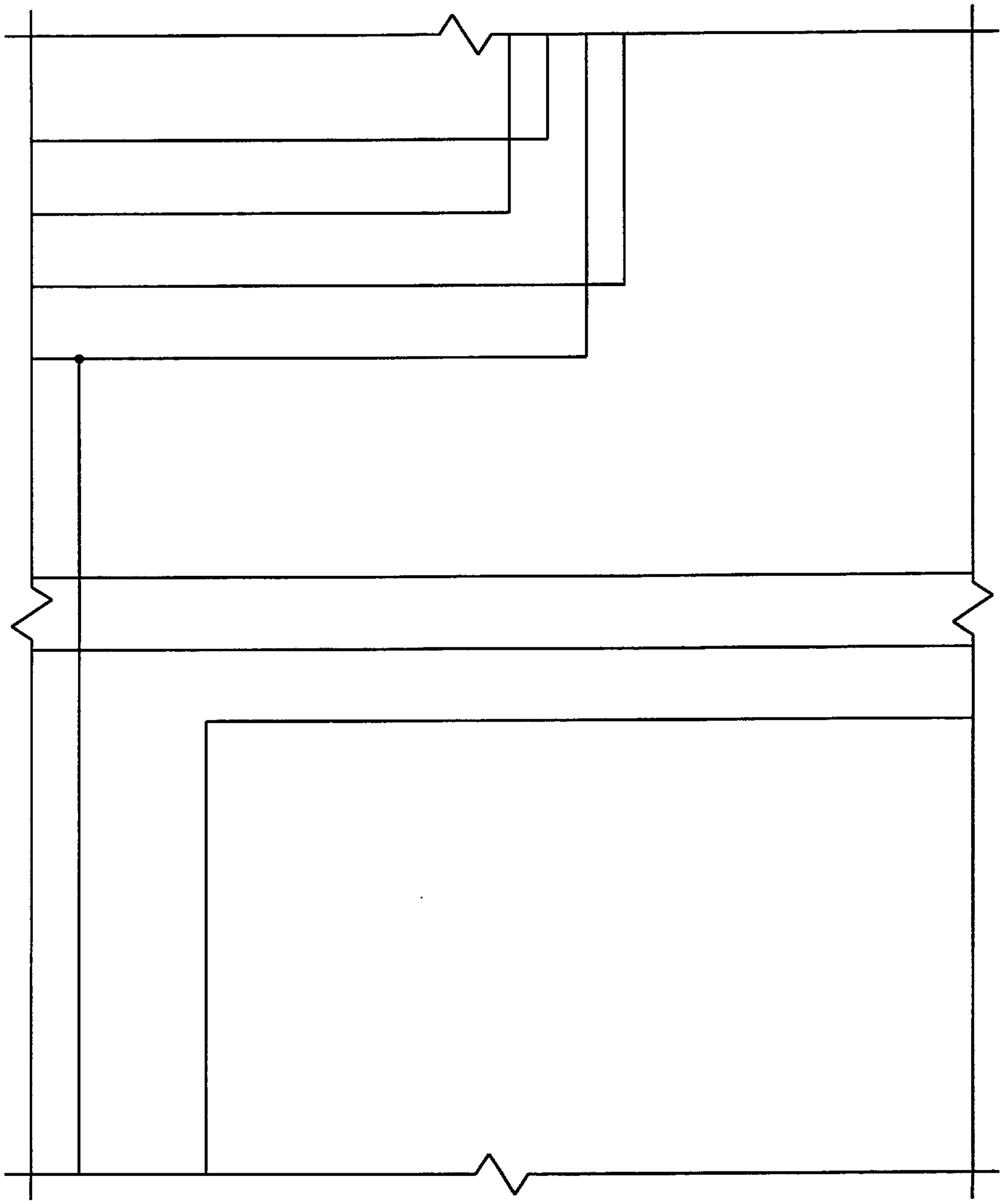
Fig 10.06CD

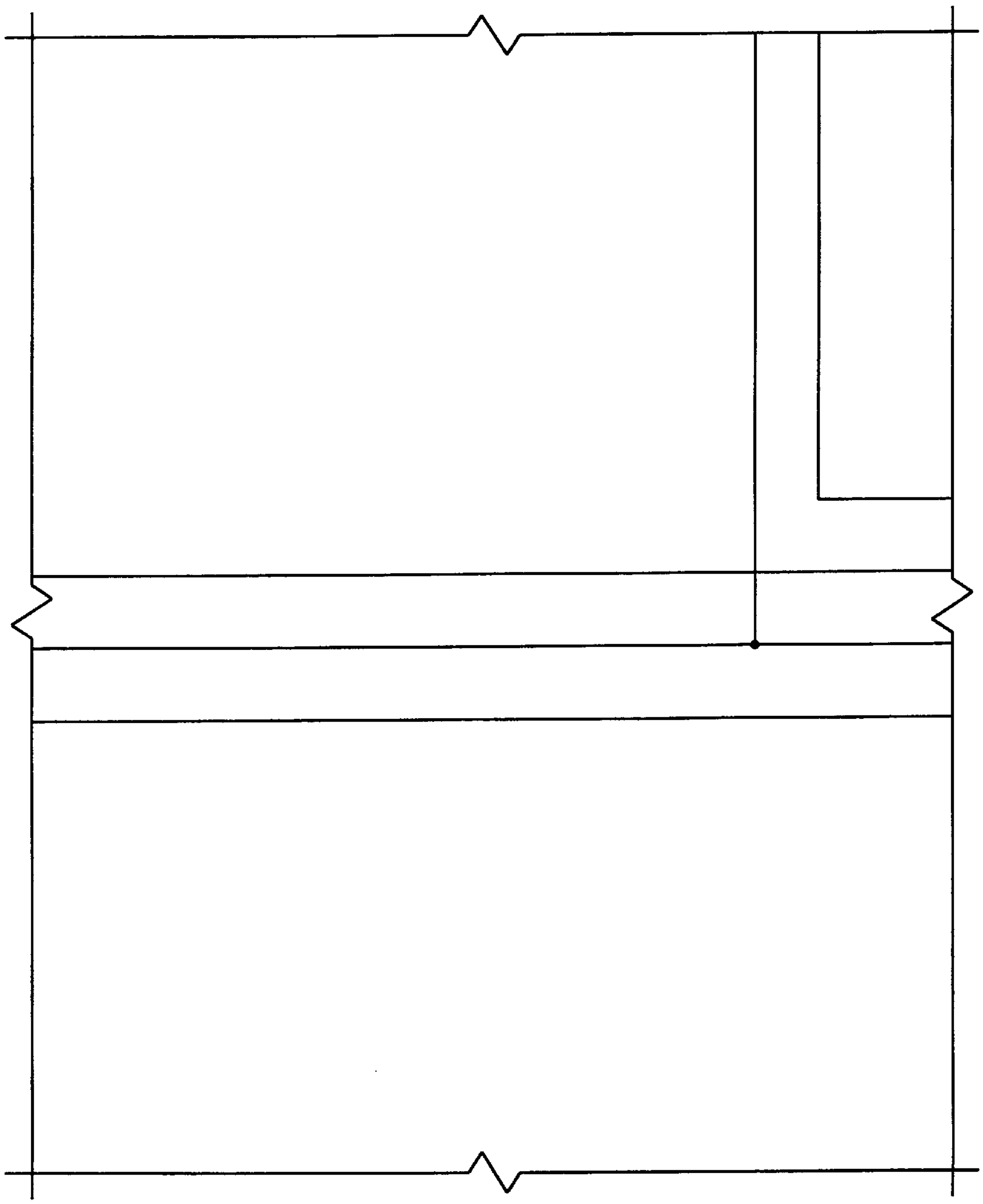
Fig 10.06CE

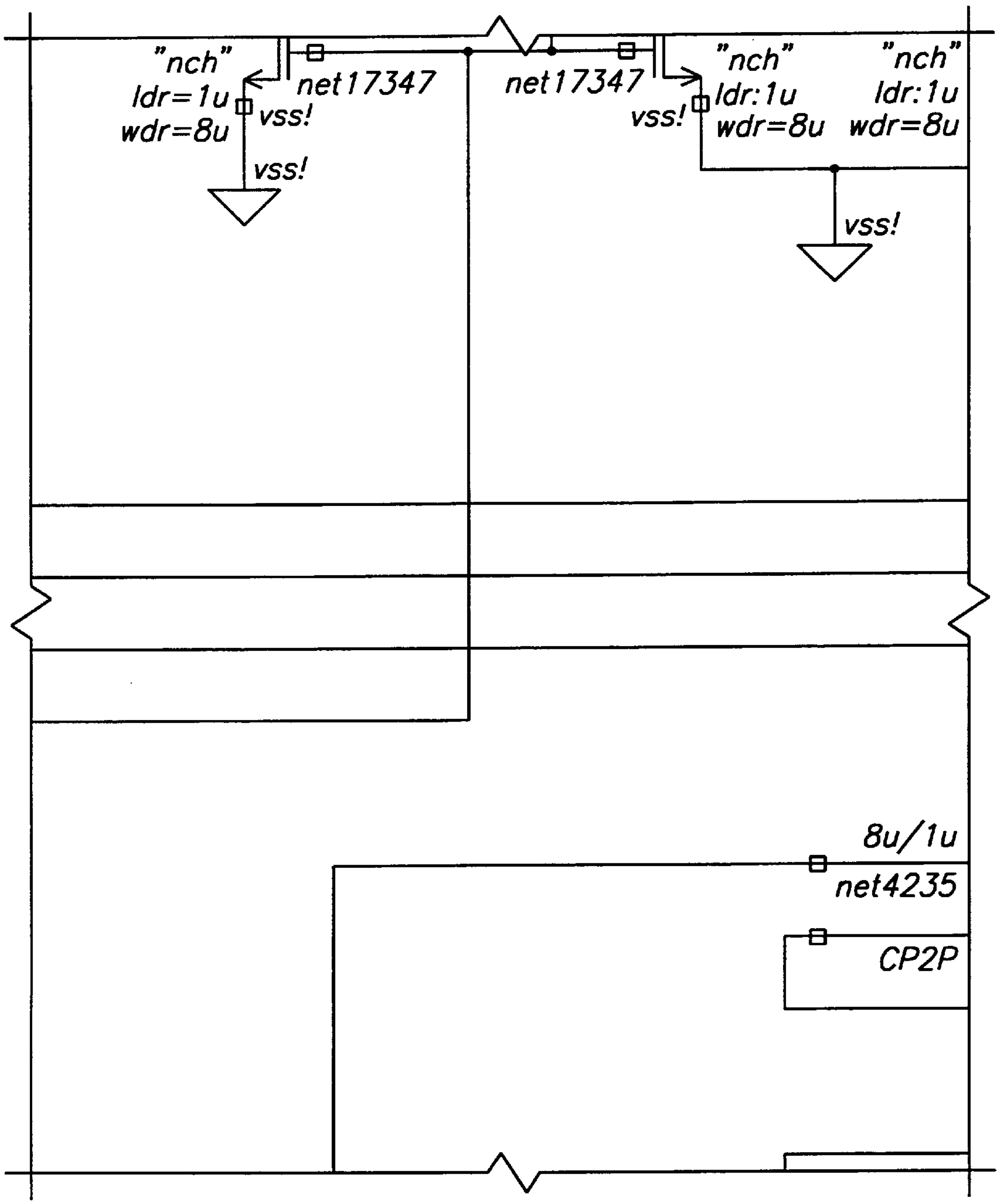
Fig 10.06CF

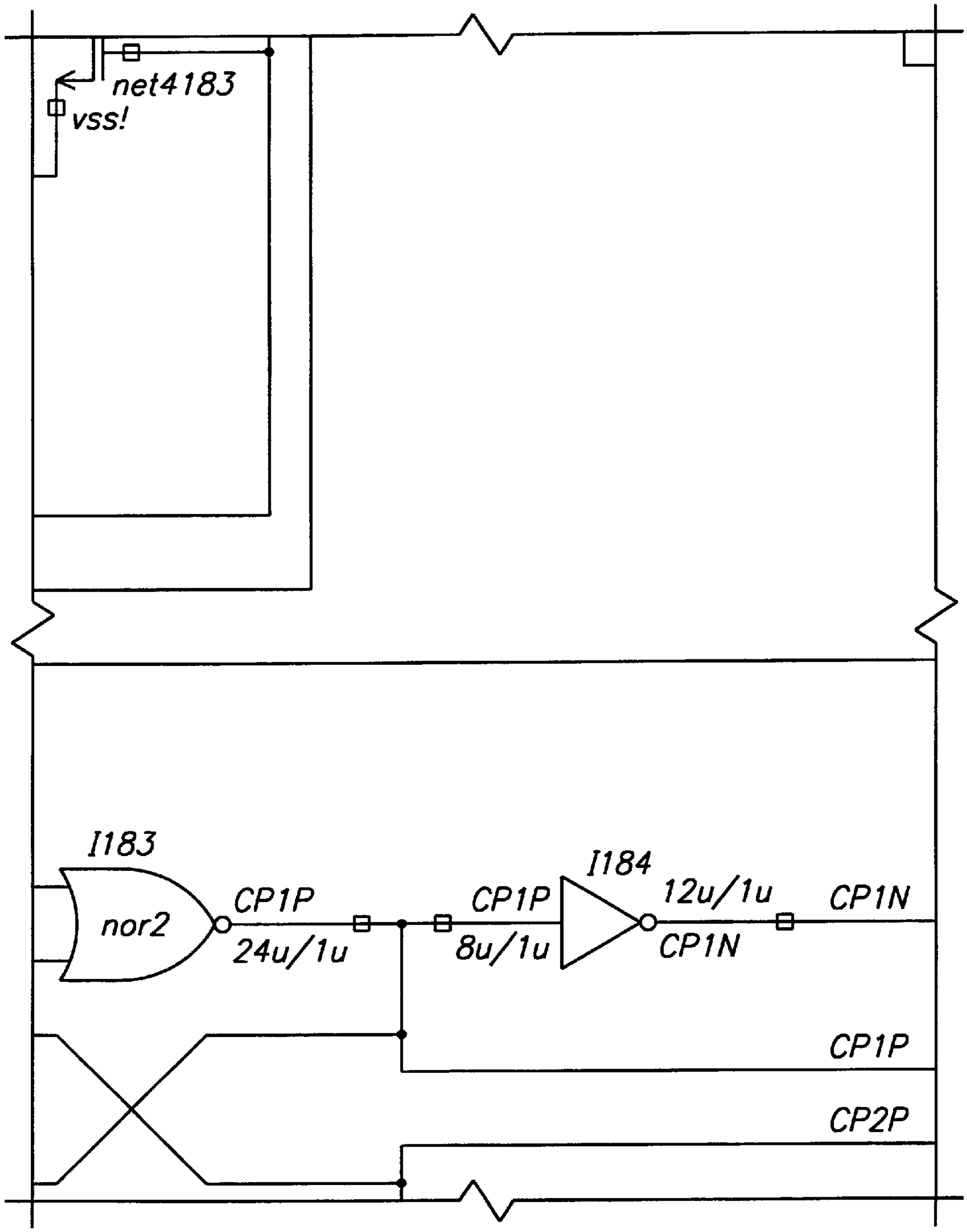
Fig 10.06CG

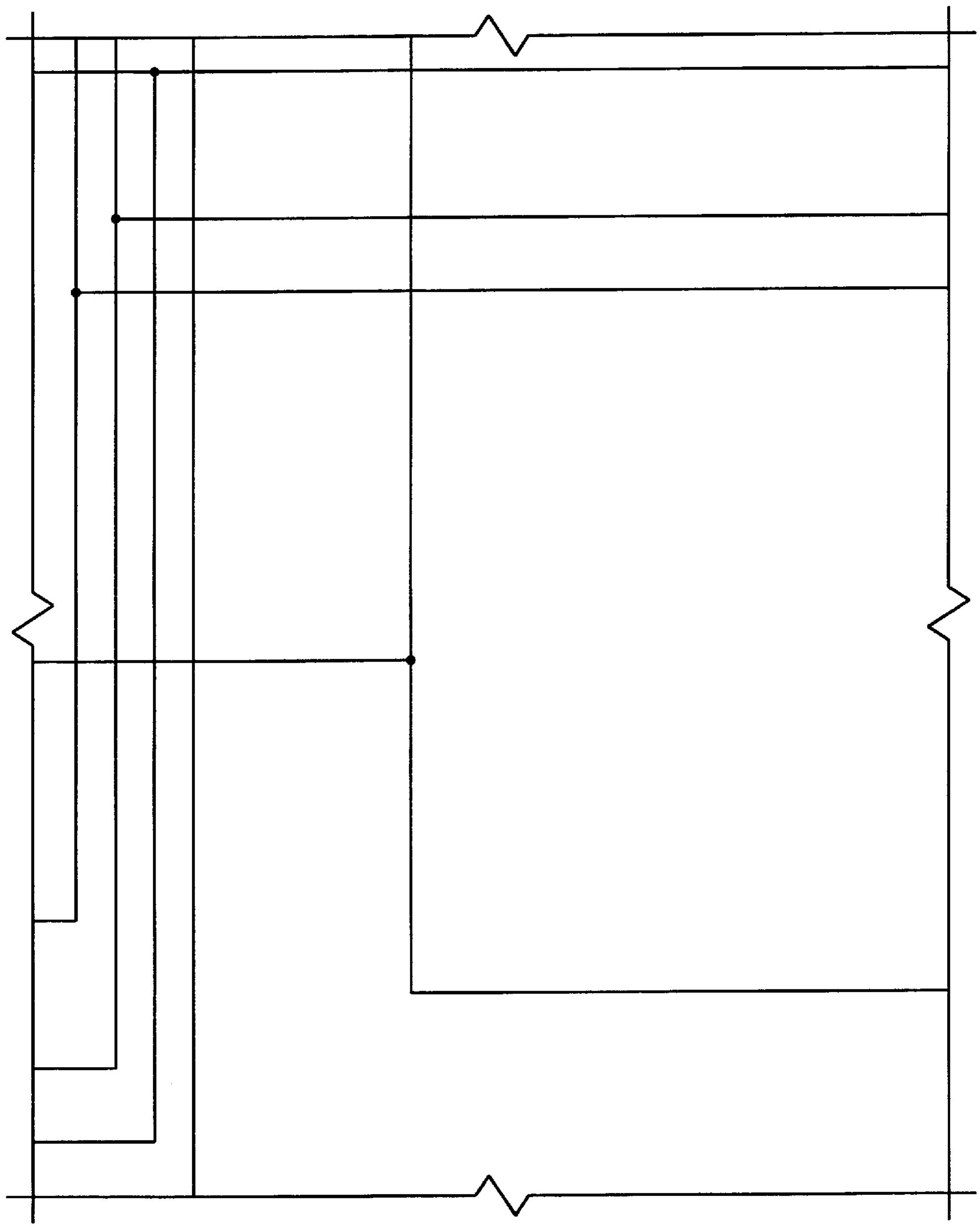
Fig 10.06CH

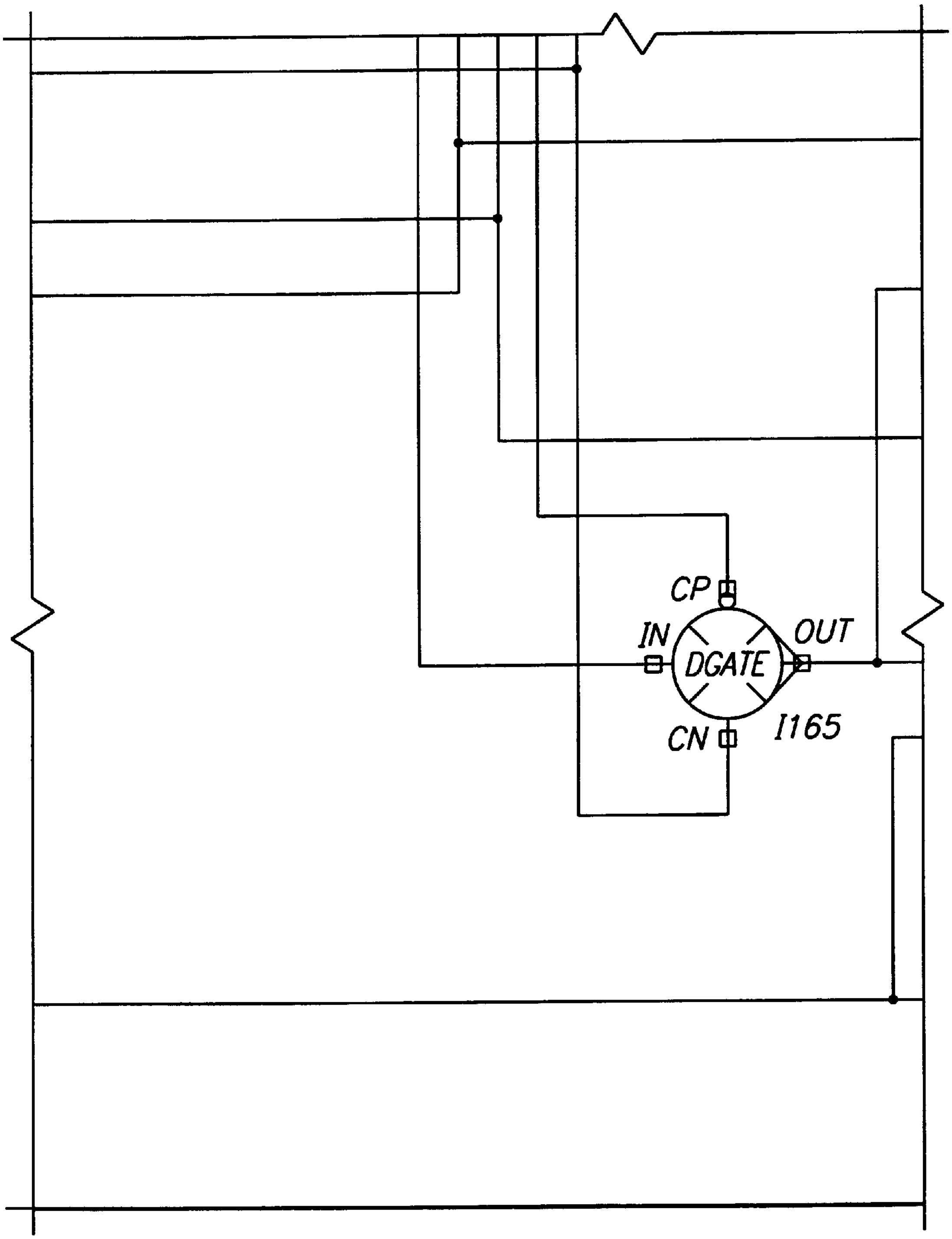
Fig 10.06CI

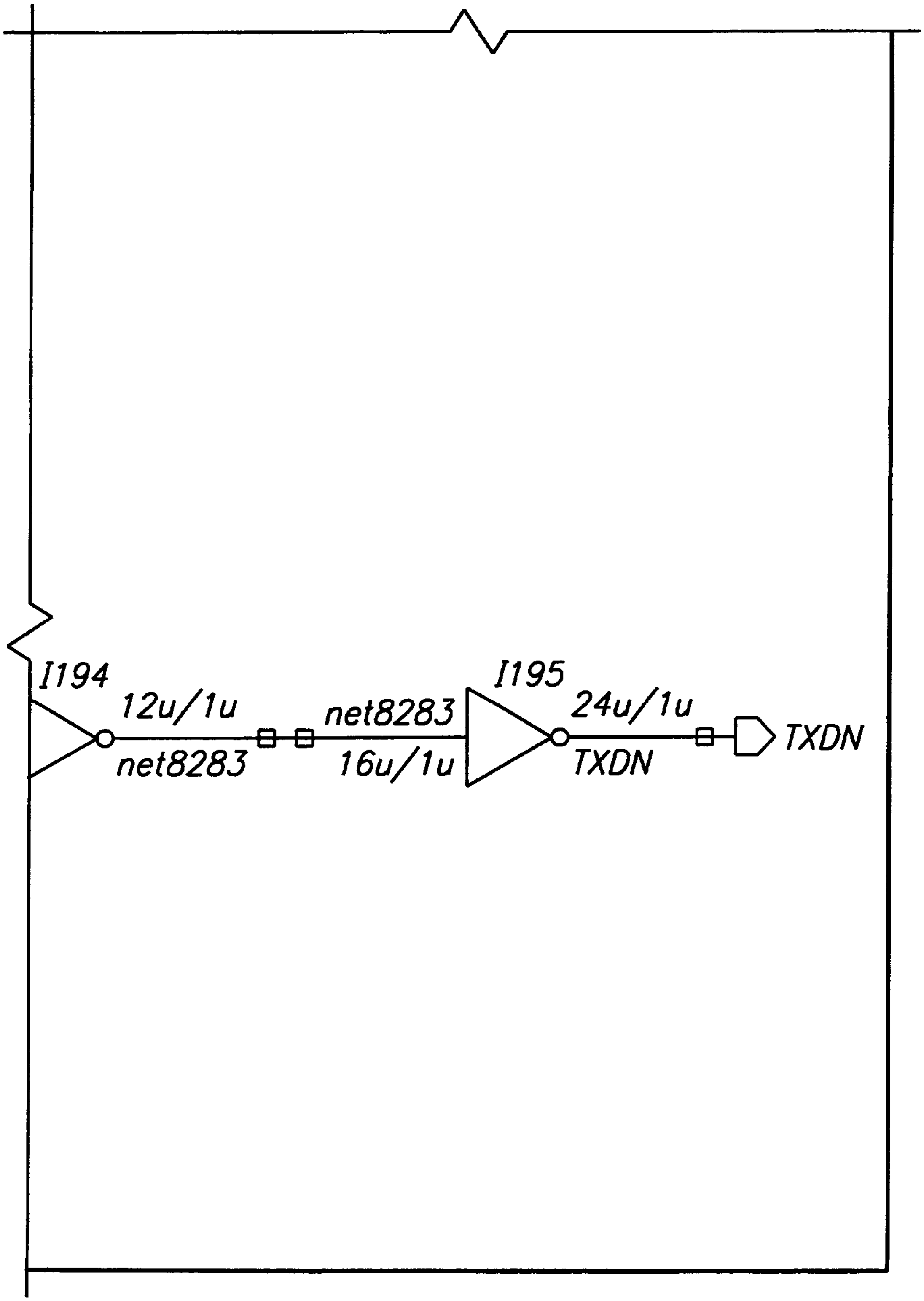
Fig 10.06CK

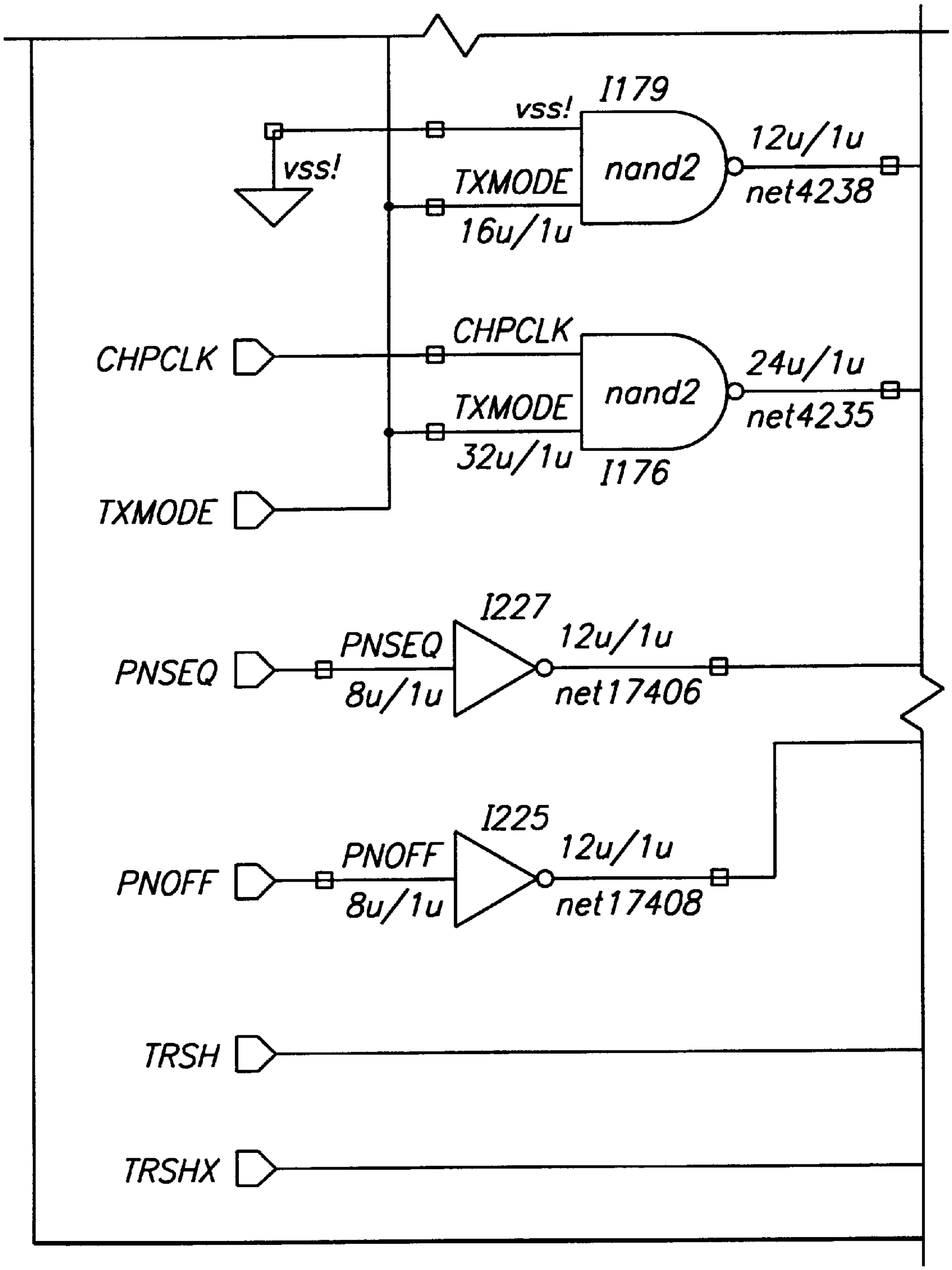
FIG. 10.06DA

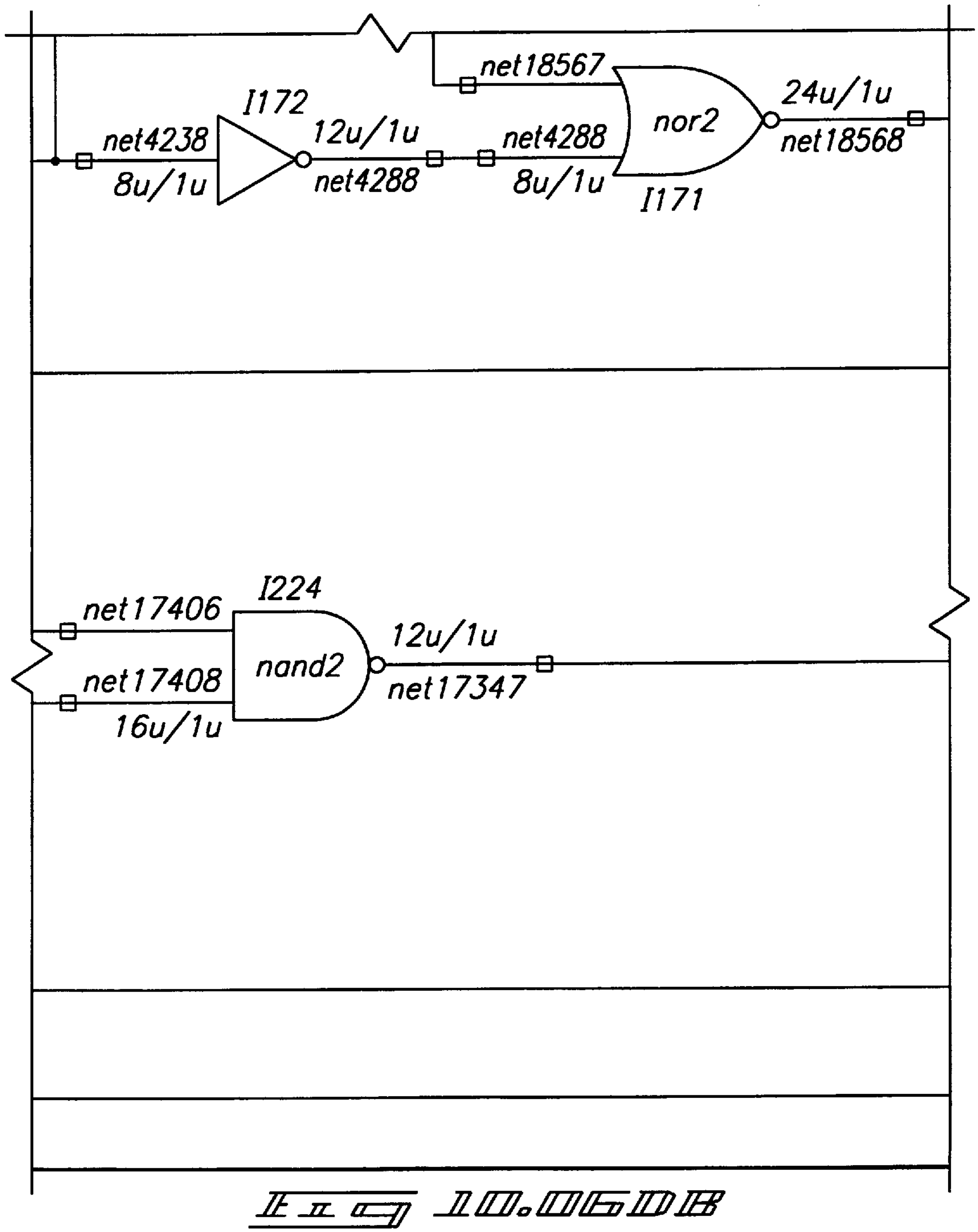
Fig 10.06DB

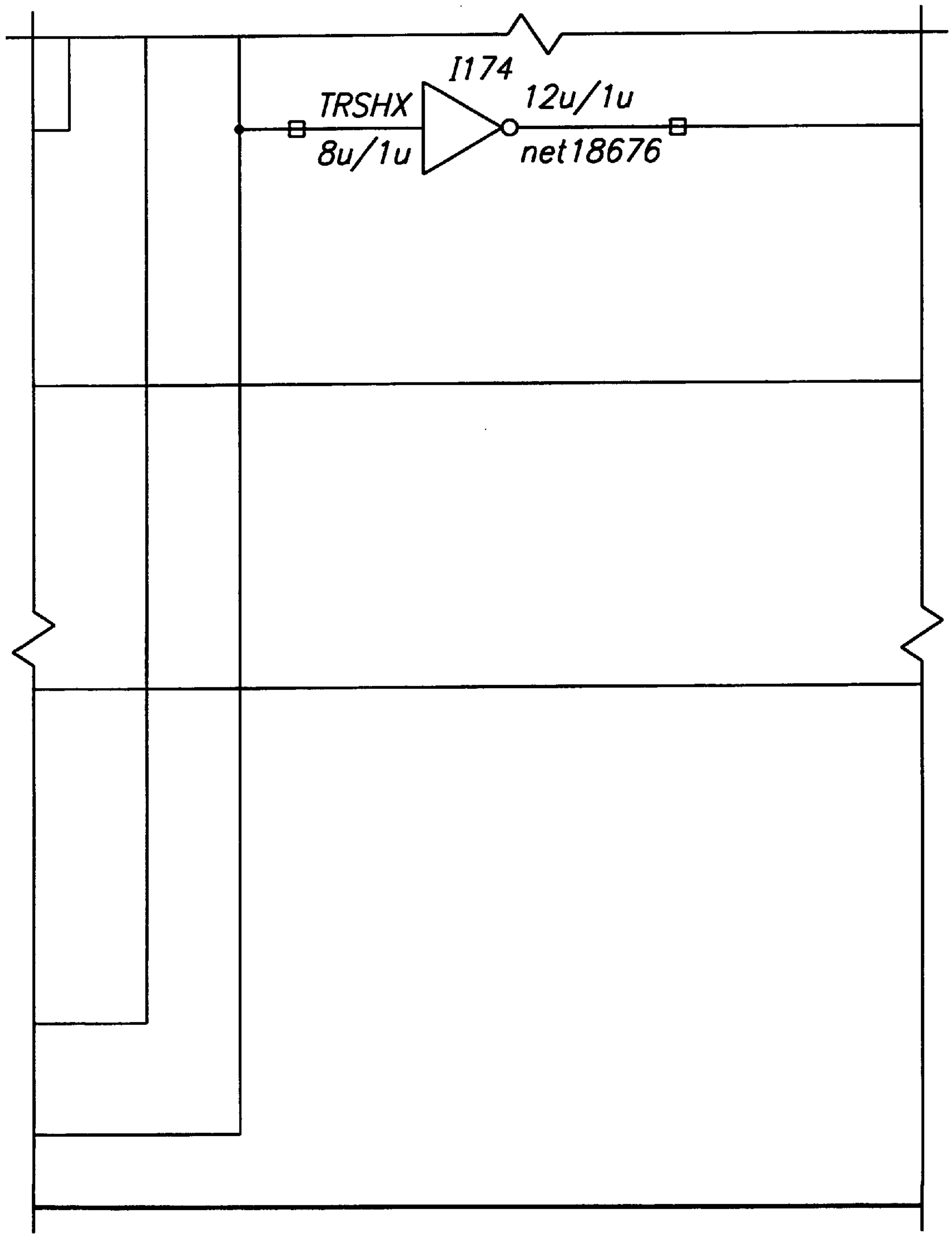
Fig 10.06DC

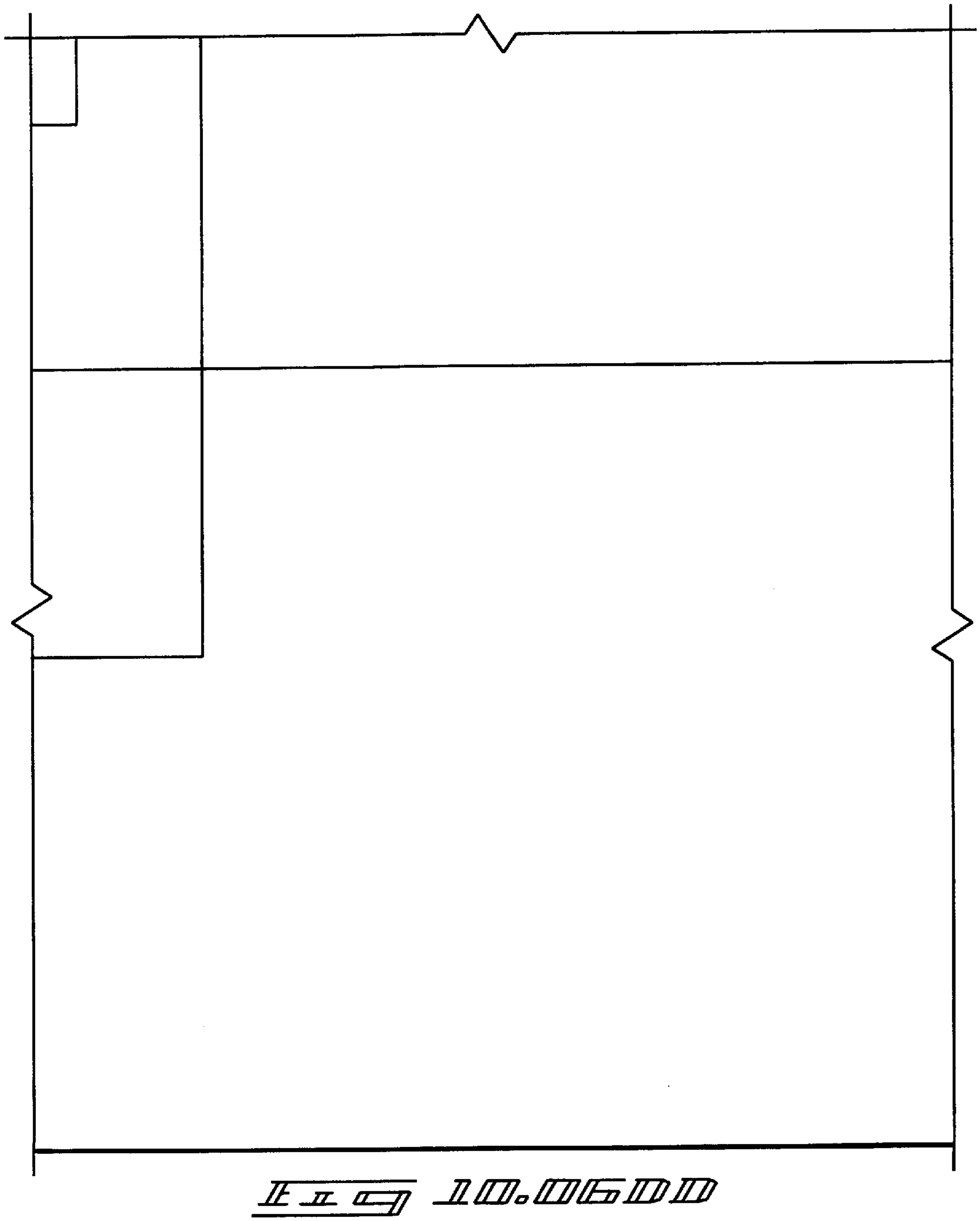
Fig 10.06DD

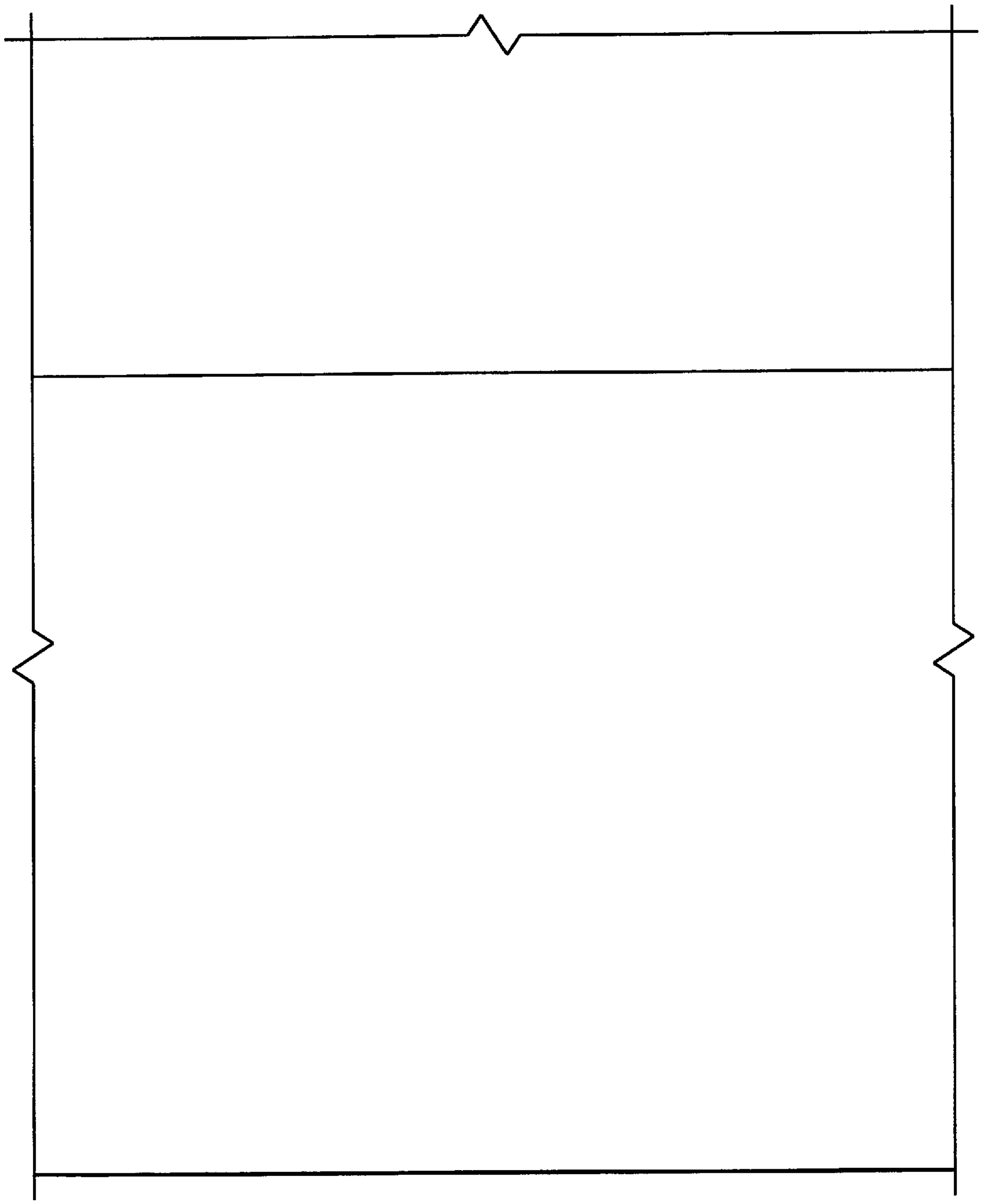
Fig 10.06DE

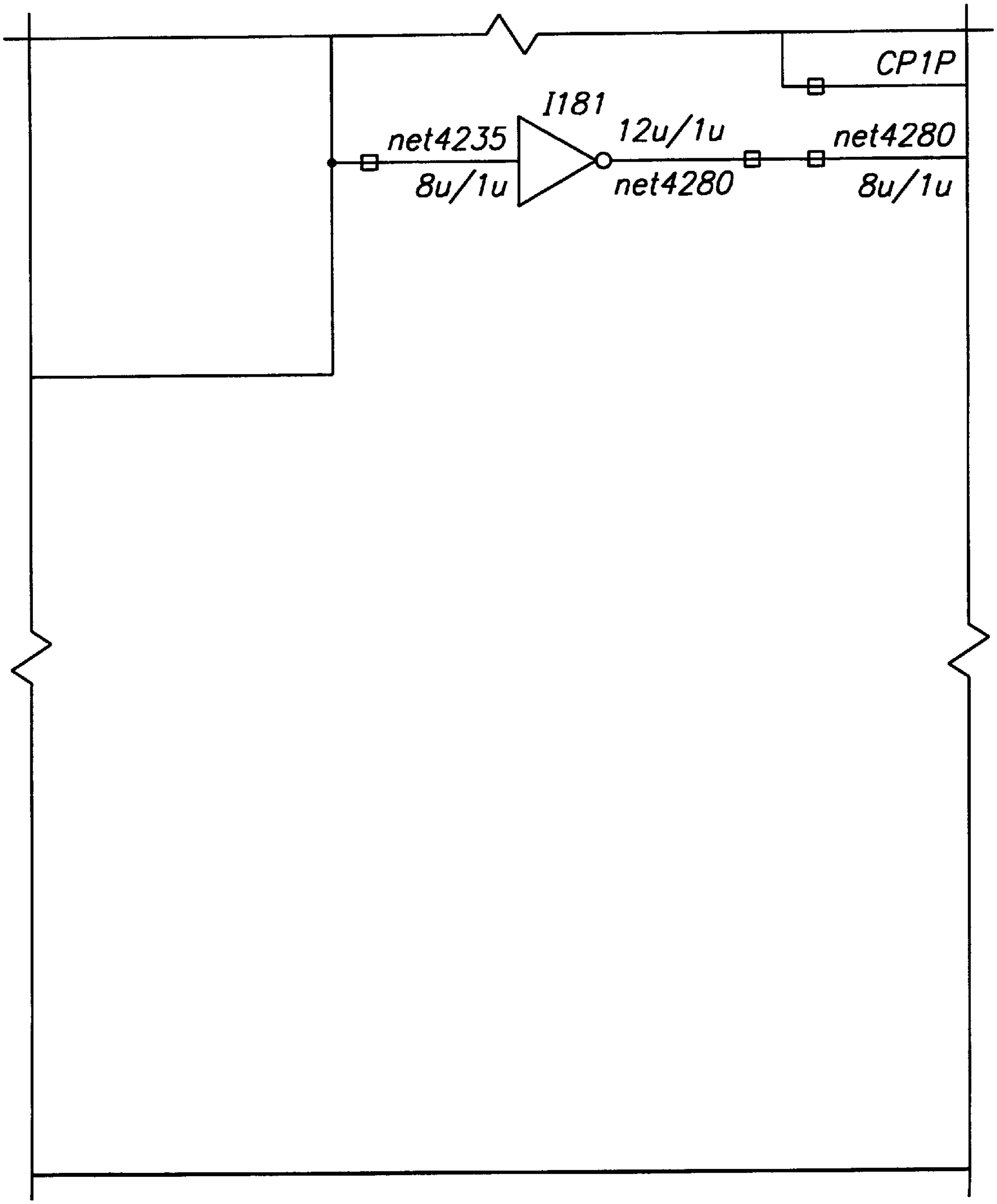
Fig 10.06DF

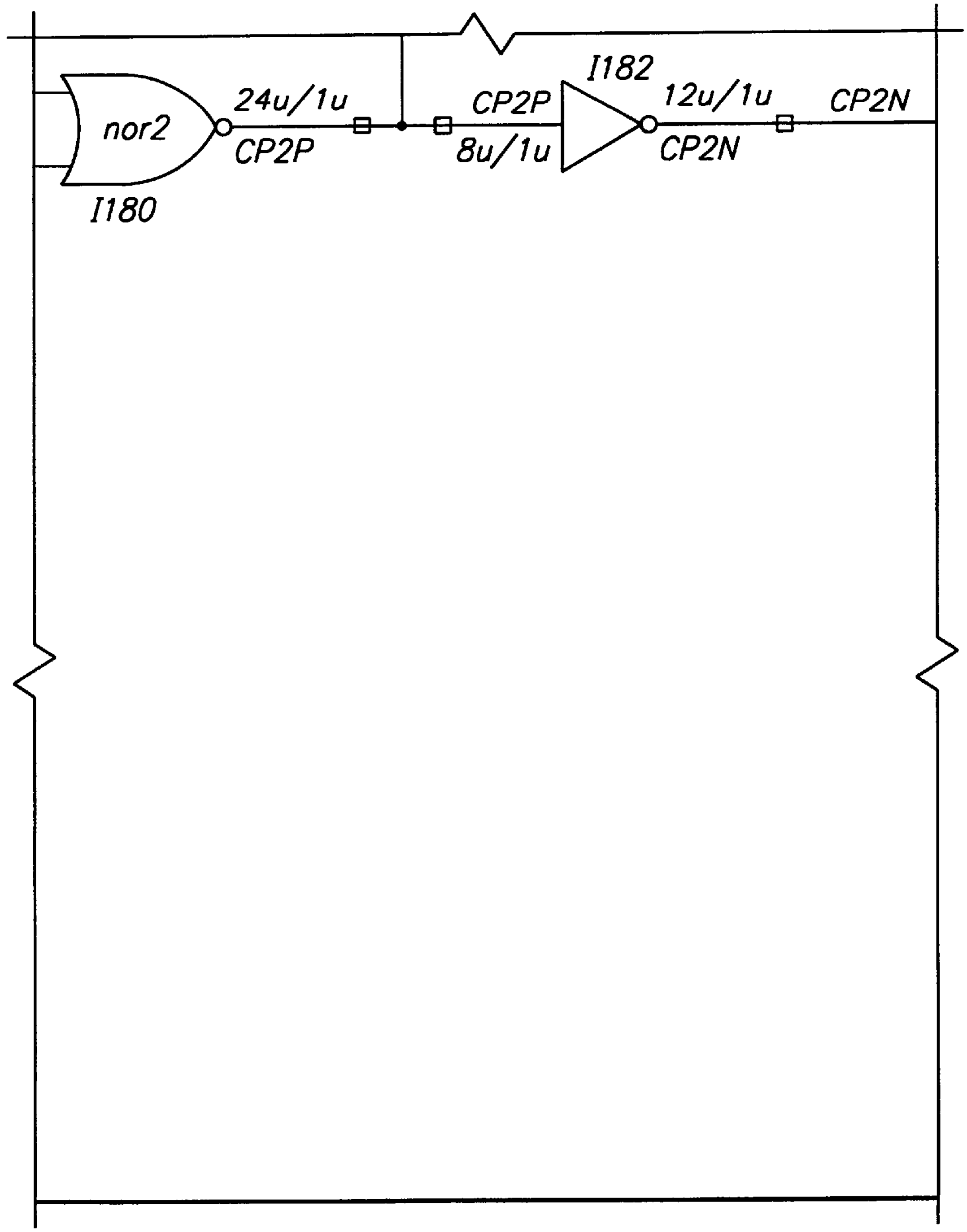
Fig 10.06DG

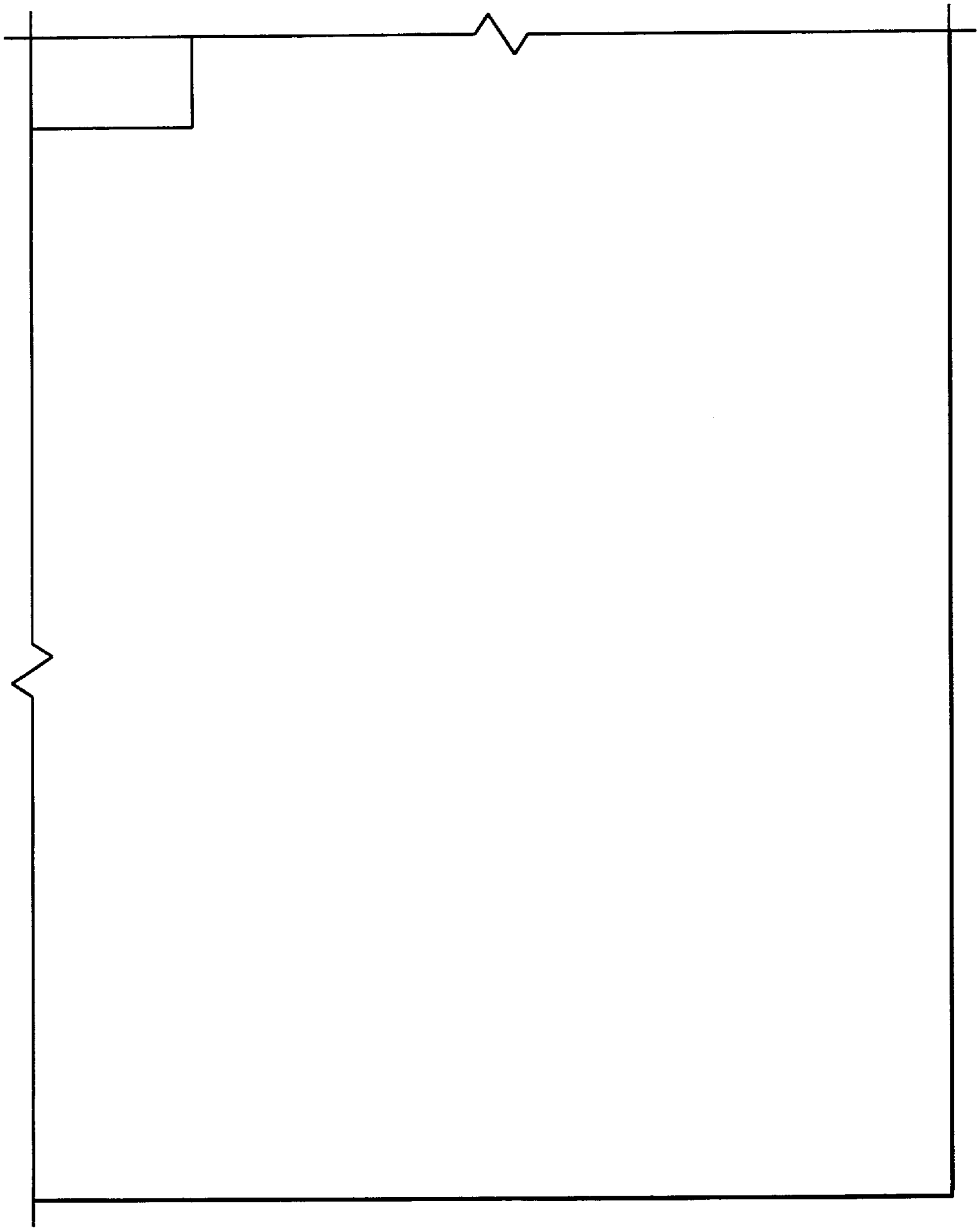
Fig 10.06DH

| | | | |
|---|---|---|---|
| 10.07AA | 10.07AB | 10.07AC | 10.07AD |
| 10.07BA | 10.07BB | 10.07BC | 10.07BD |
| 10.07CA | 10.07CB | 10.07CC | 10.07CD |

Fig 10.07

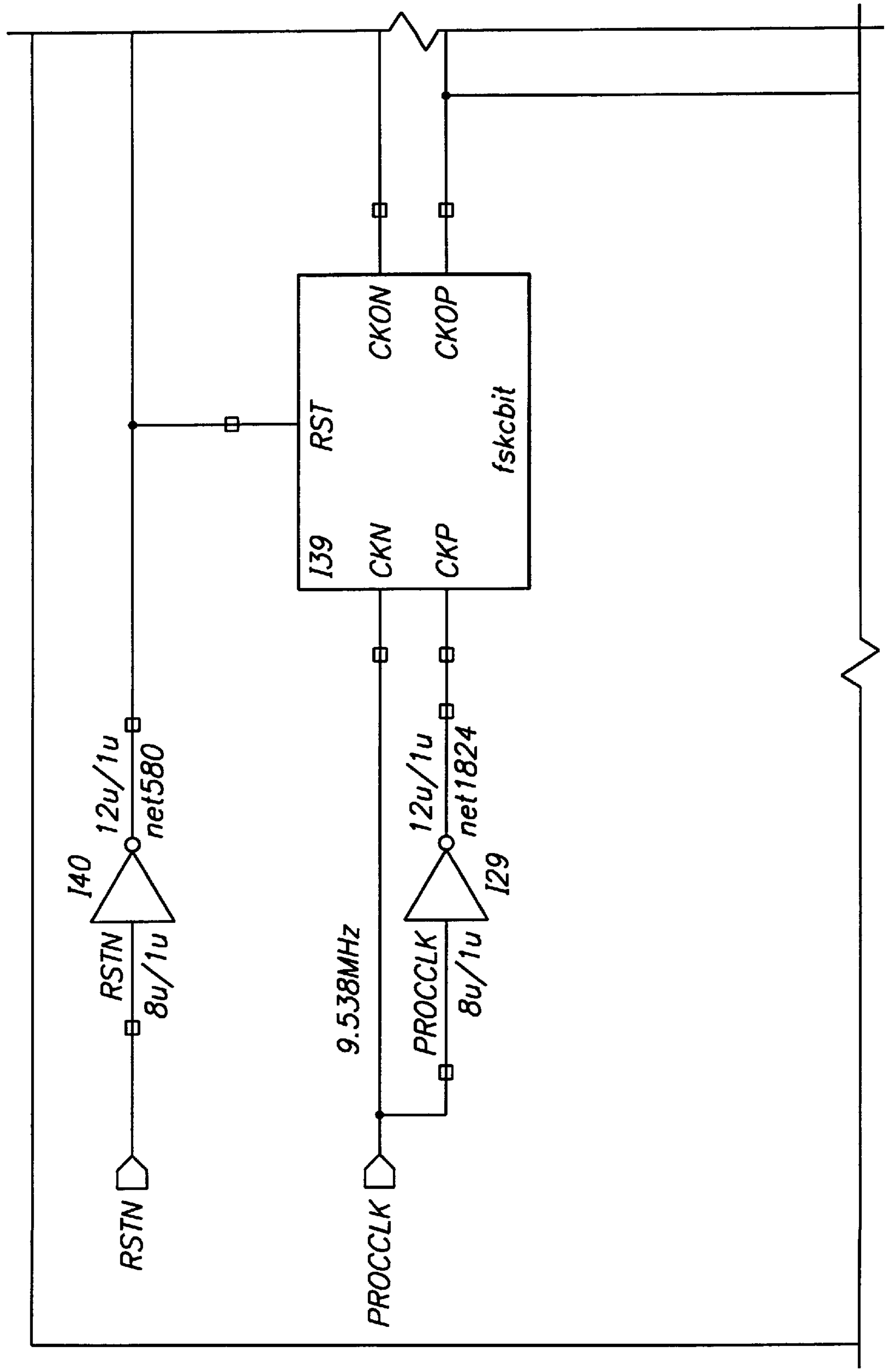
FIG. 10.07AA

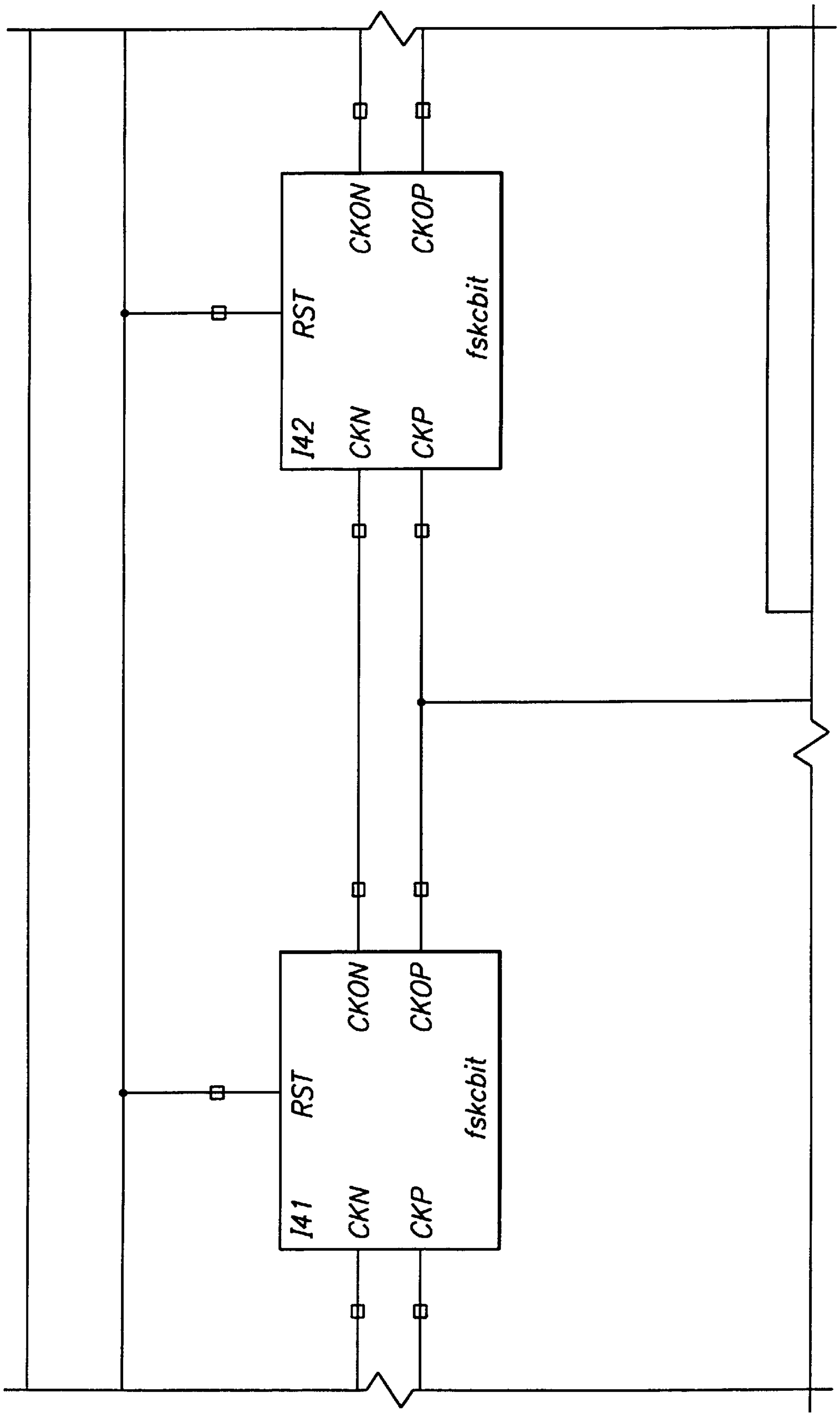
FIG. 10.07AB

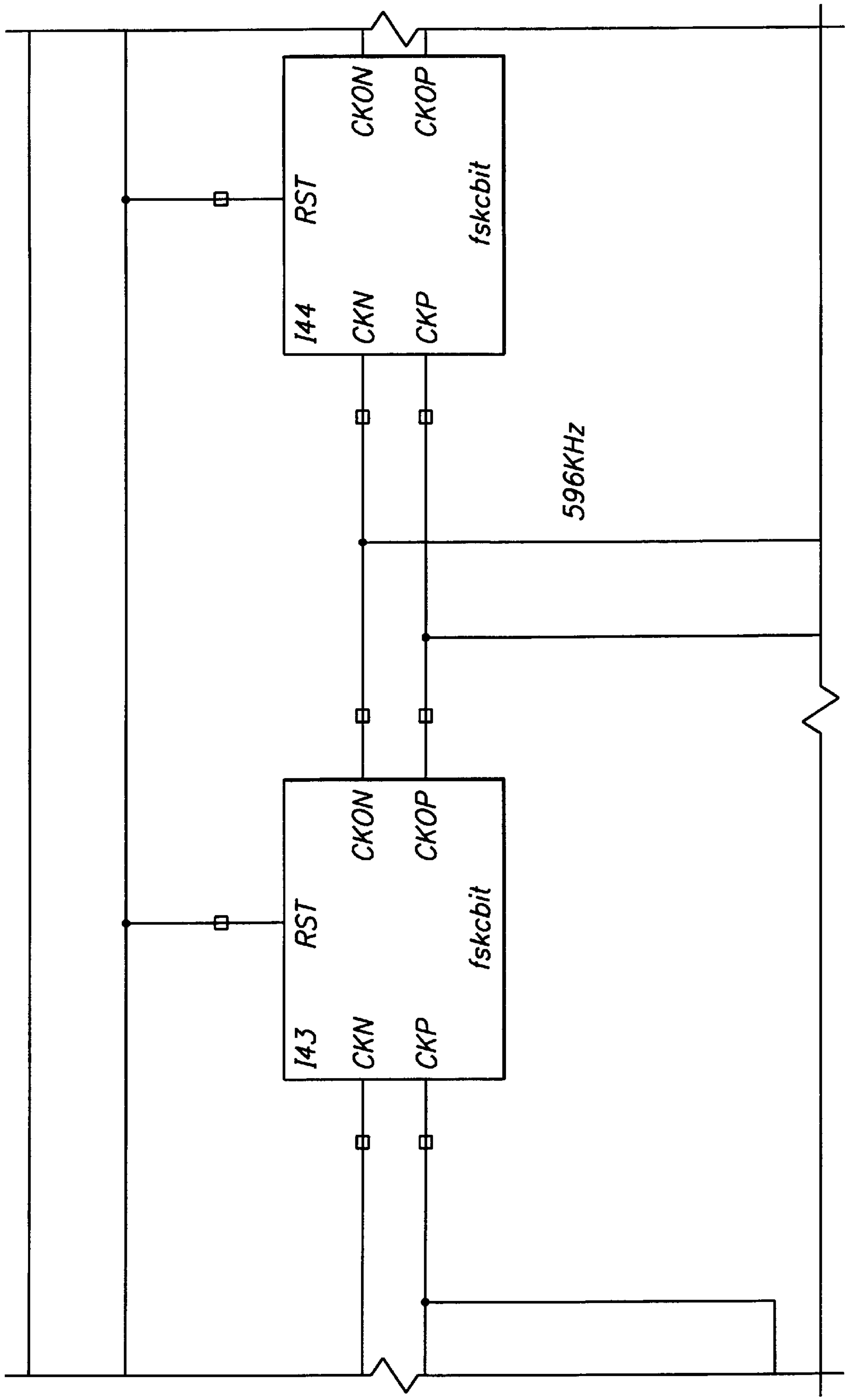
Fig 10.07AC

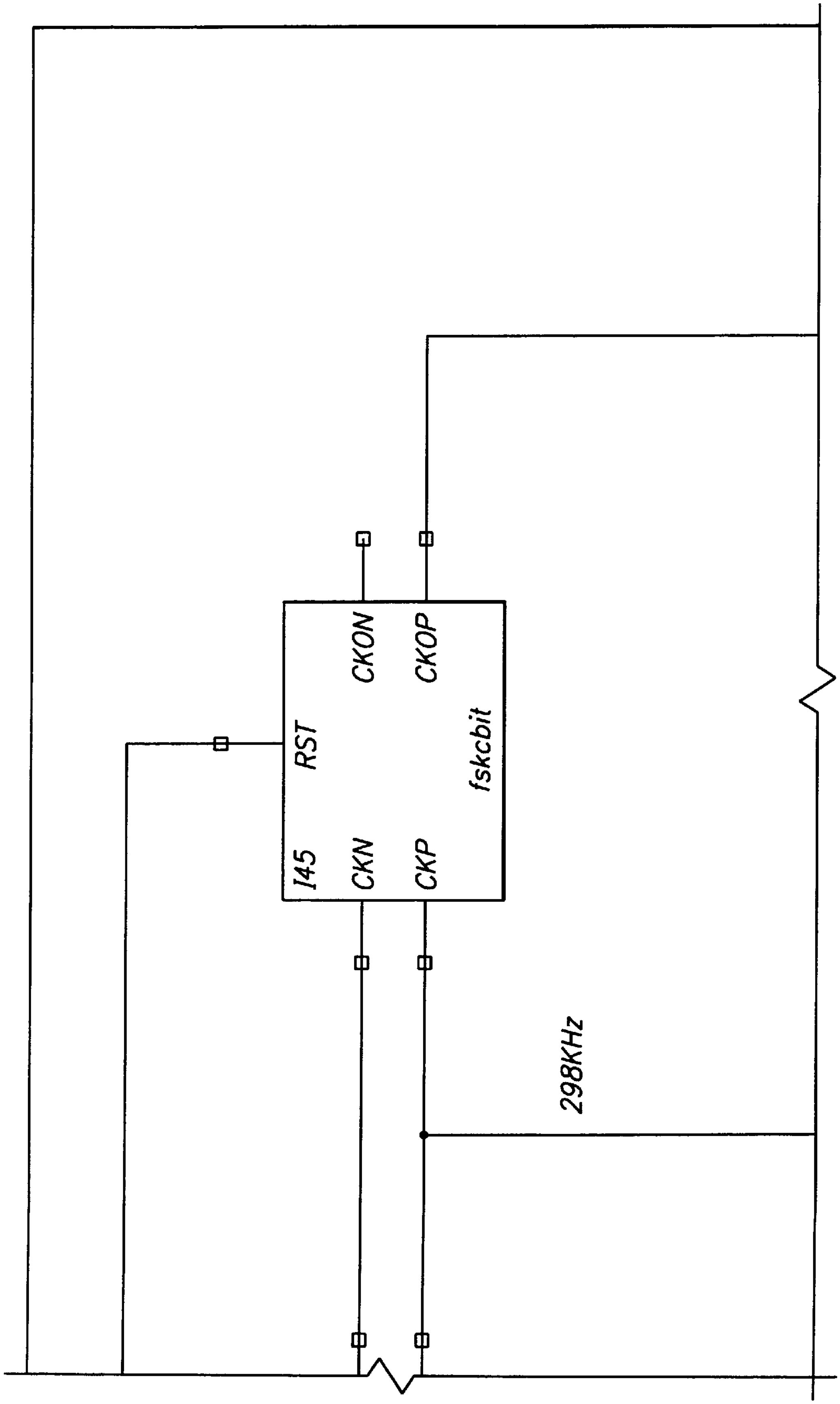
FIG. 10.07AD

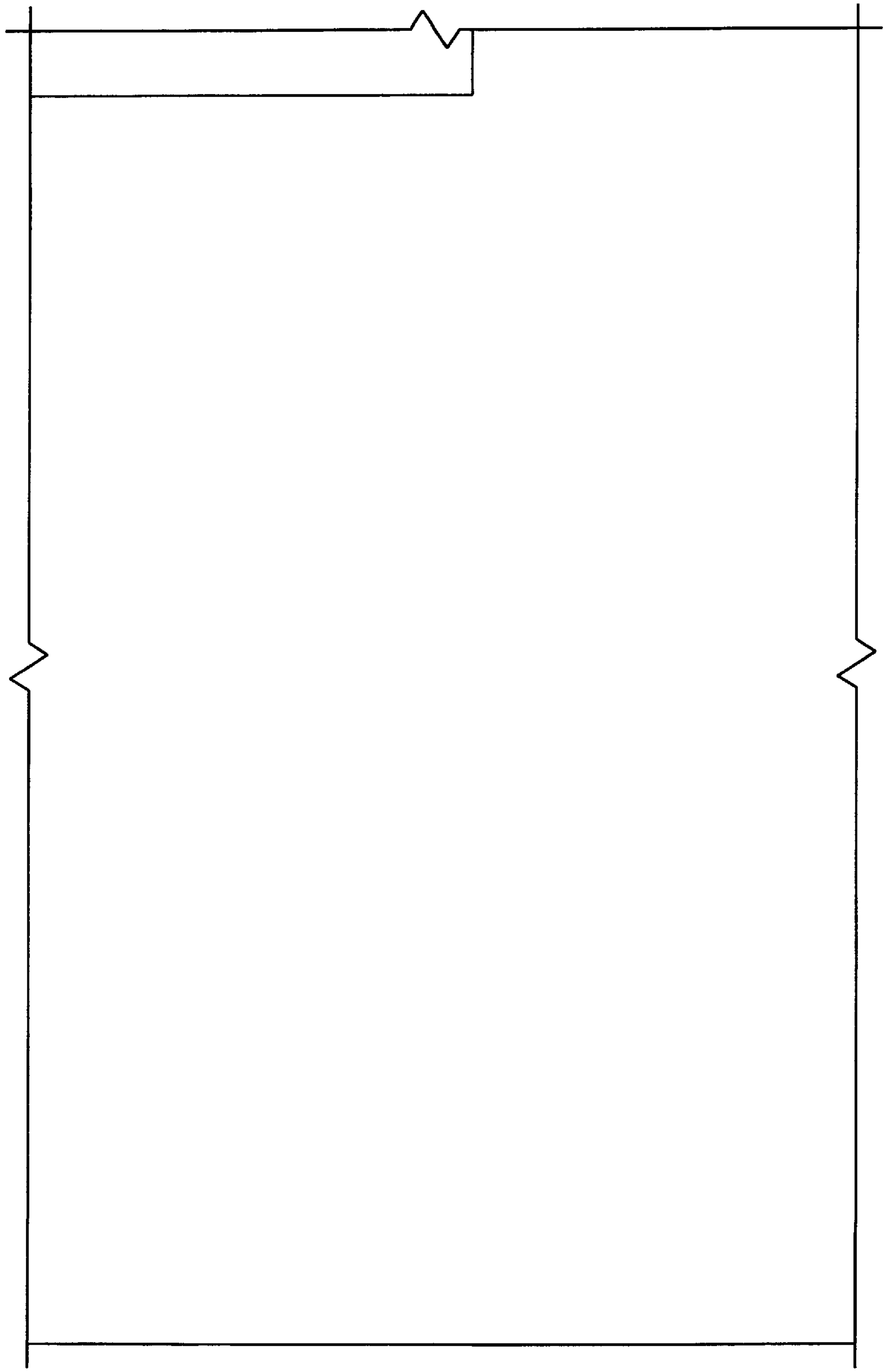
FIG. 10.07BA

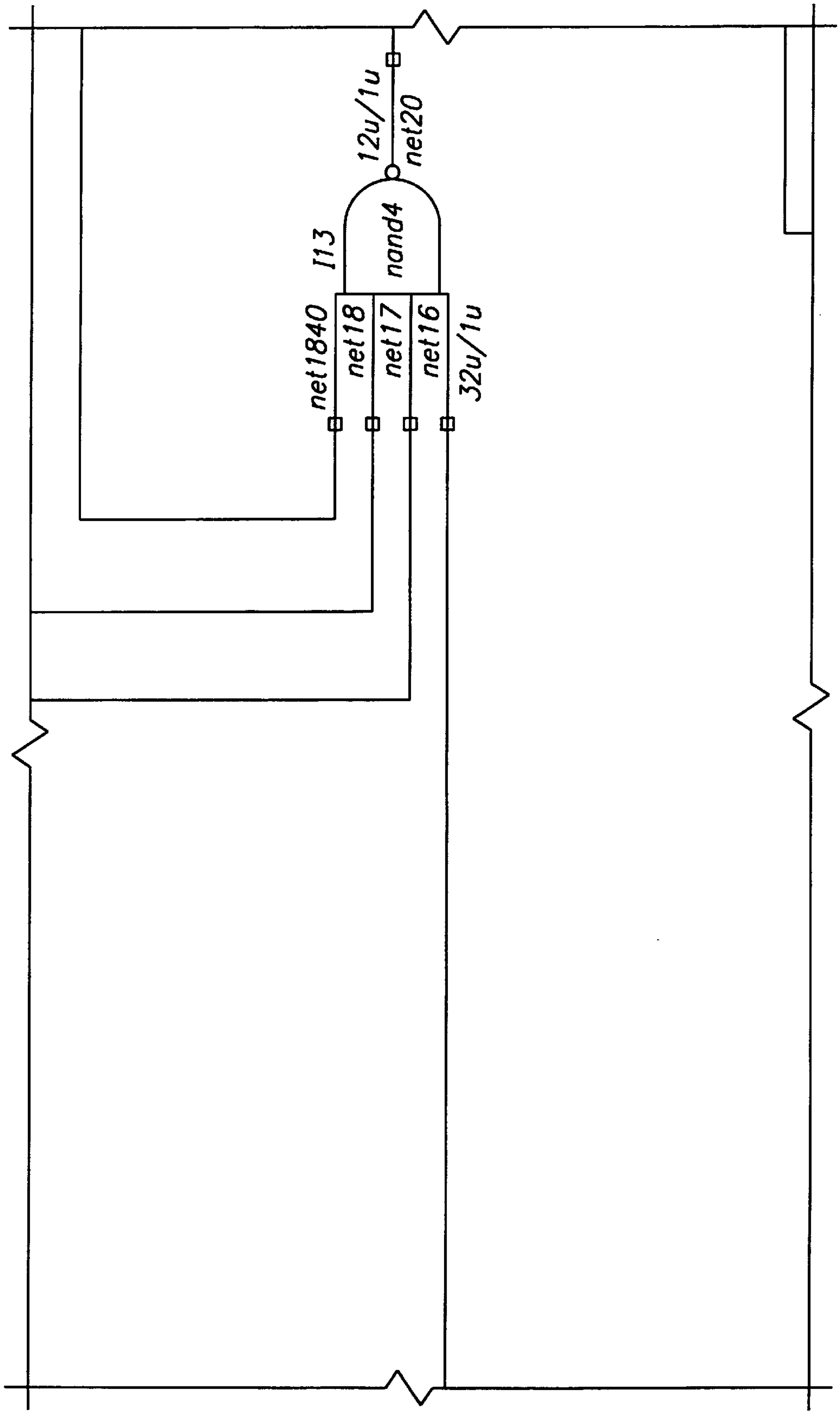
Fig. 10.07BB

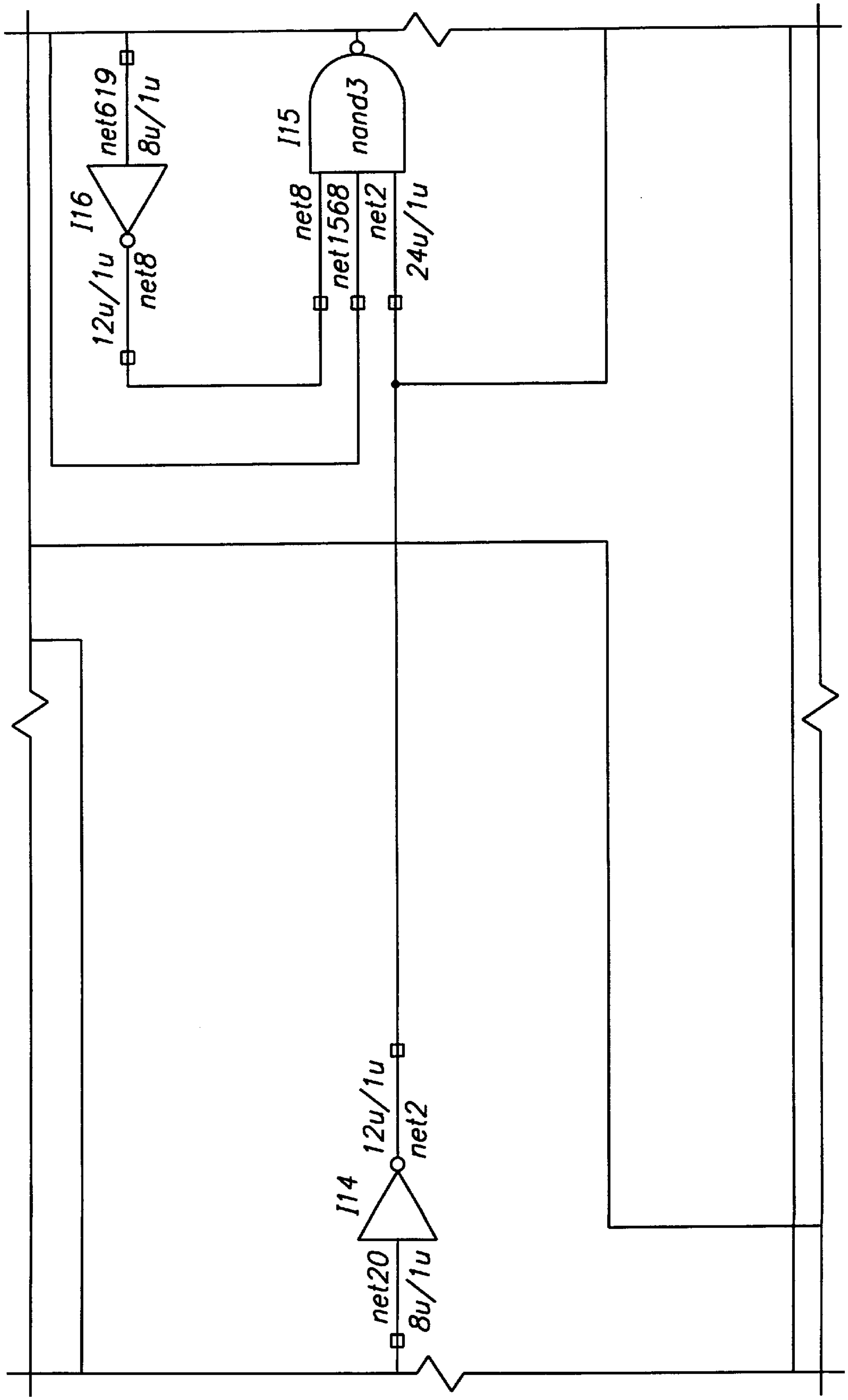
FIG. 10.07BC

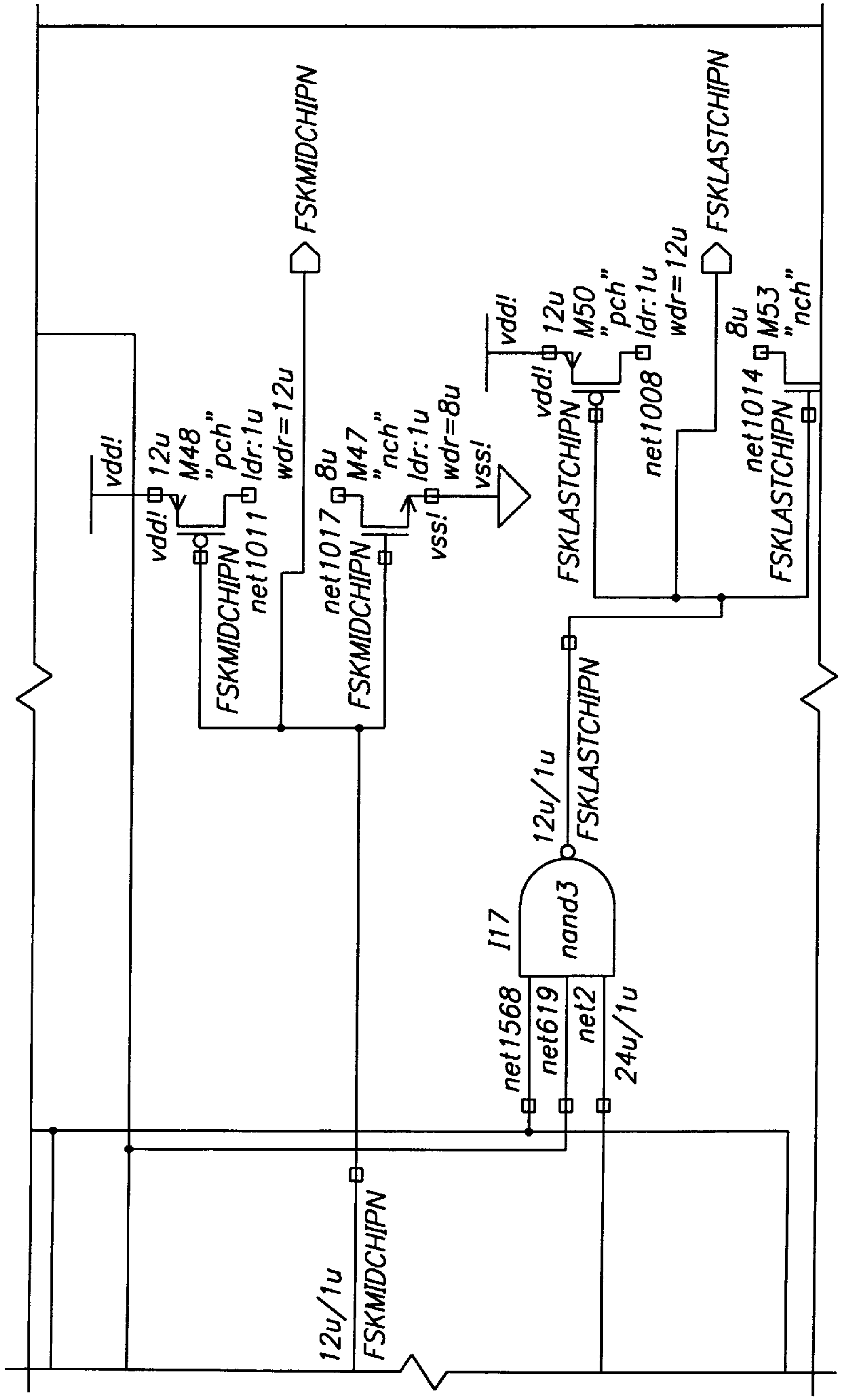
FIG. 10.07LBD

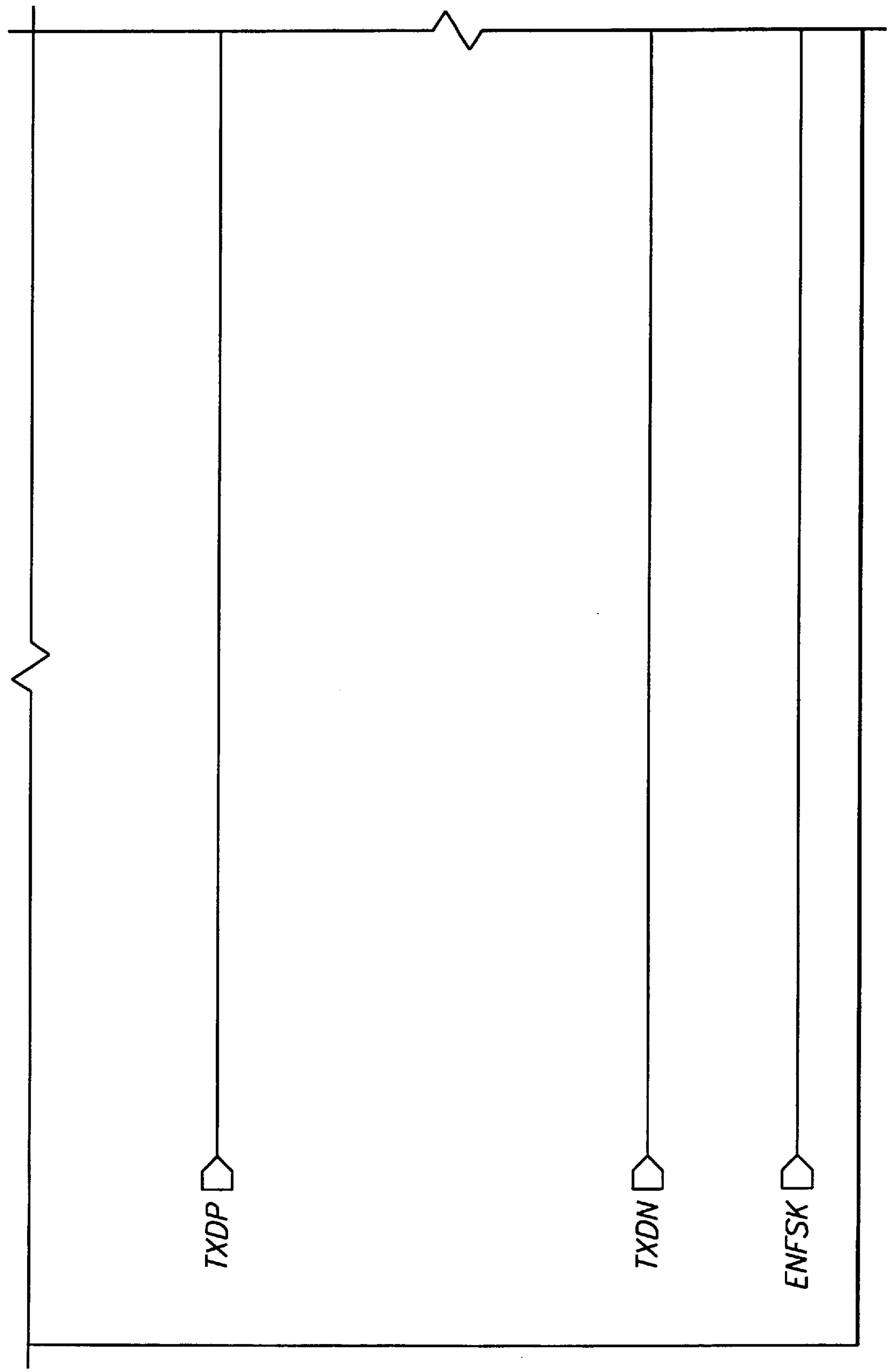
Fig. 10.07CA

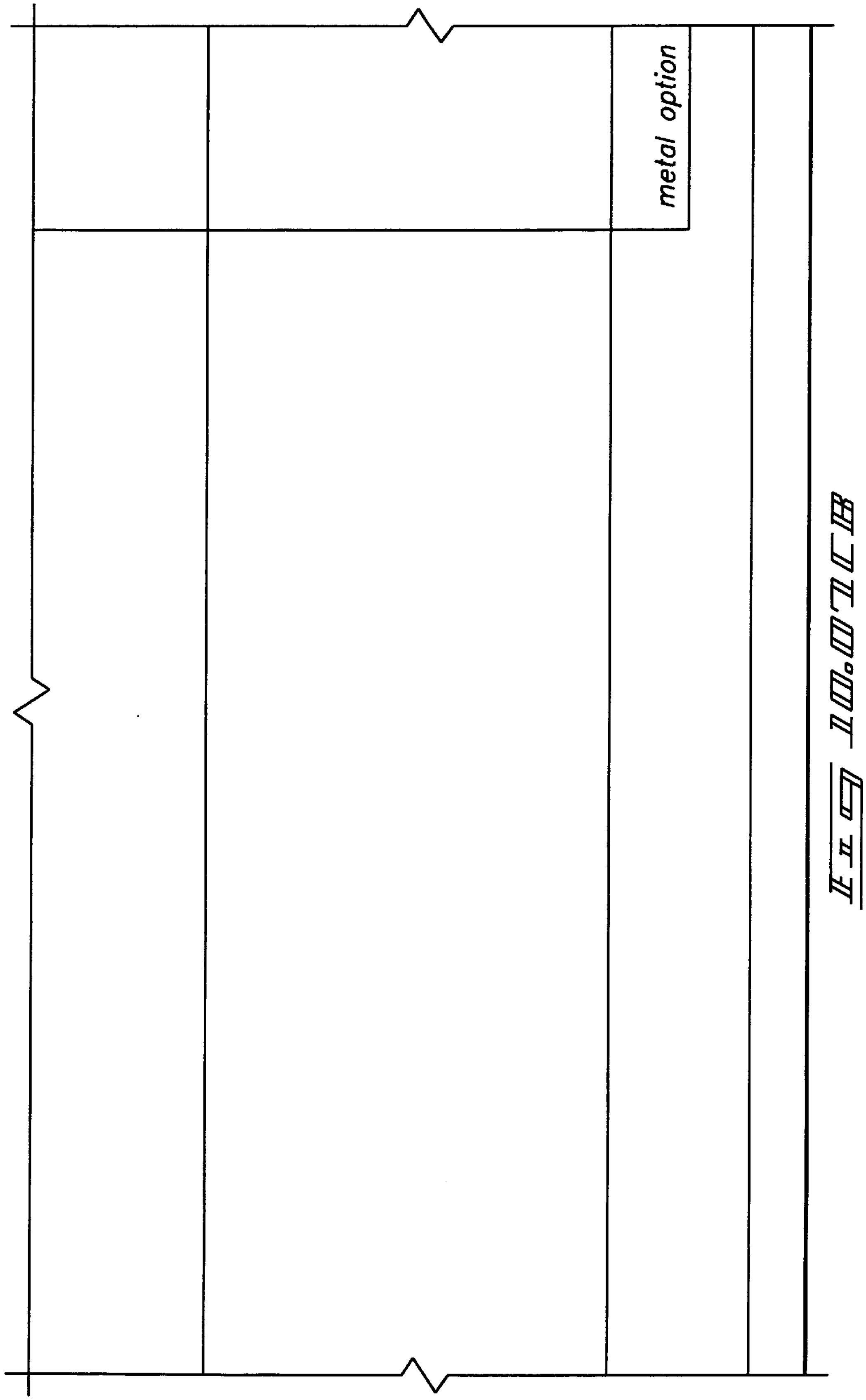
Fig. 10.07CB

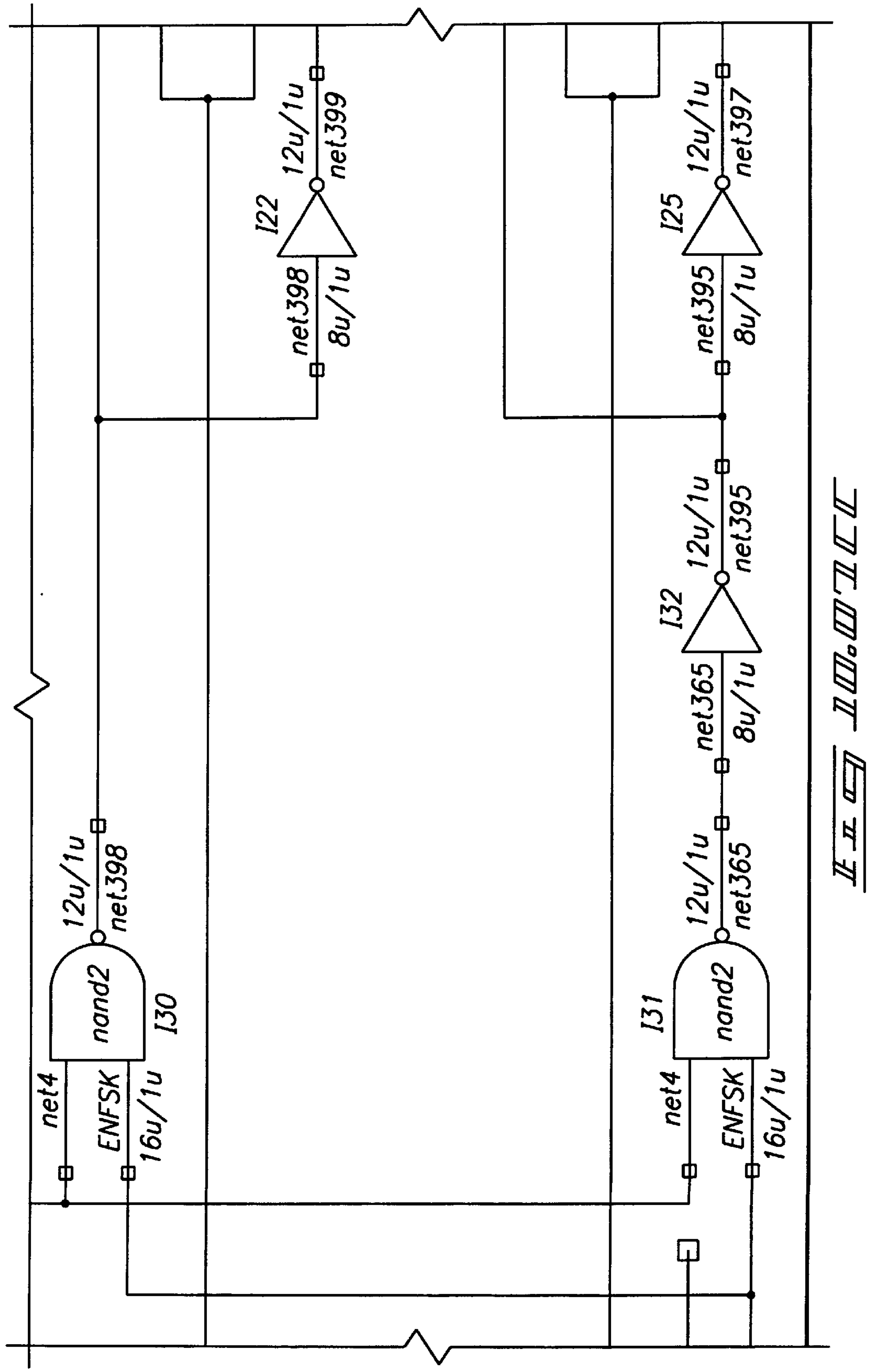
FIG. 10.07CC

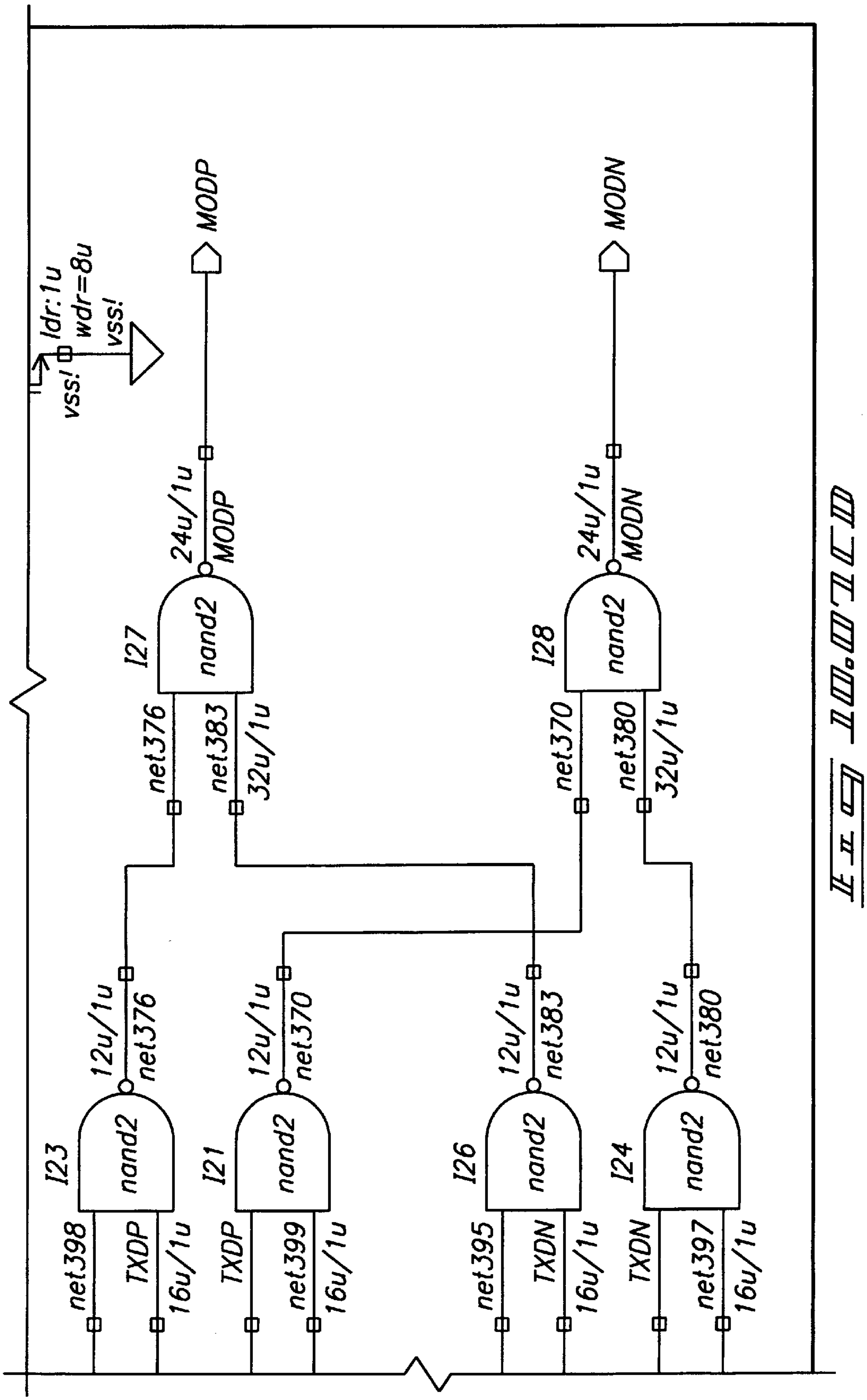
FIG. 10.07CD

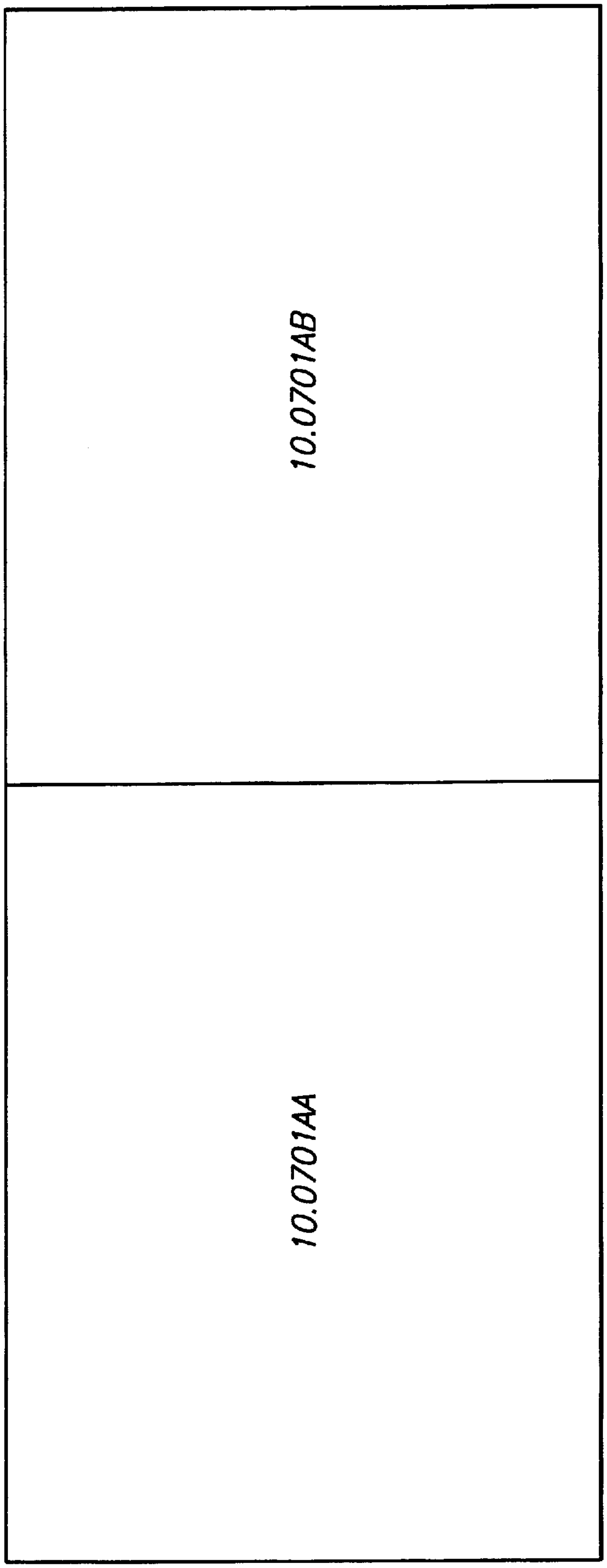
FIG. 10.0701

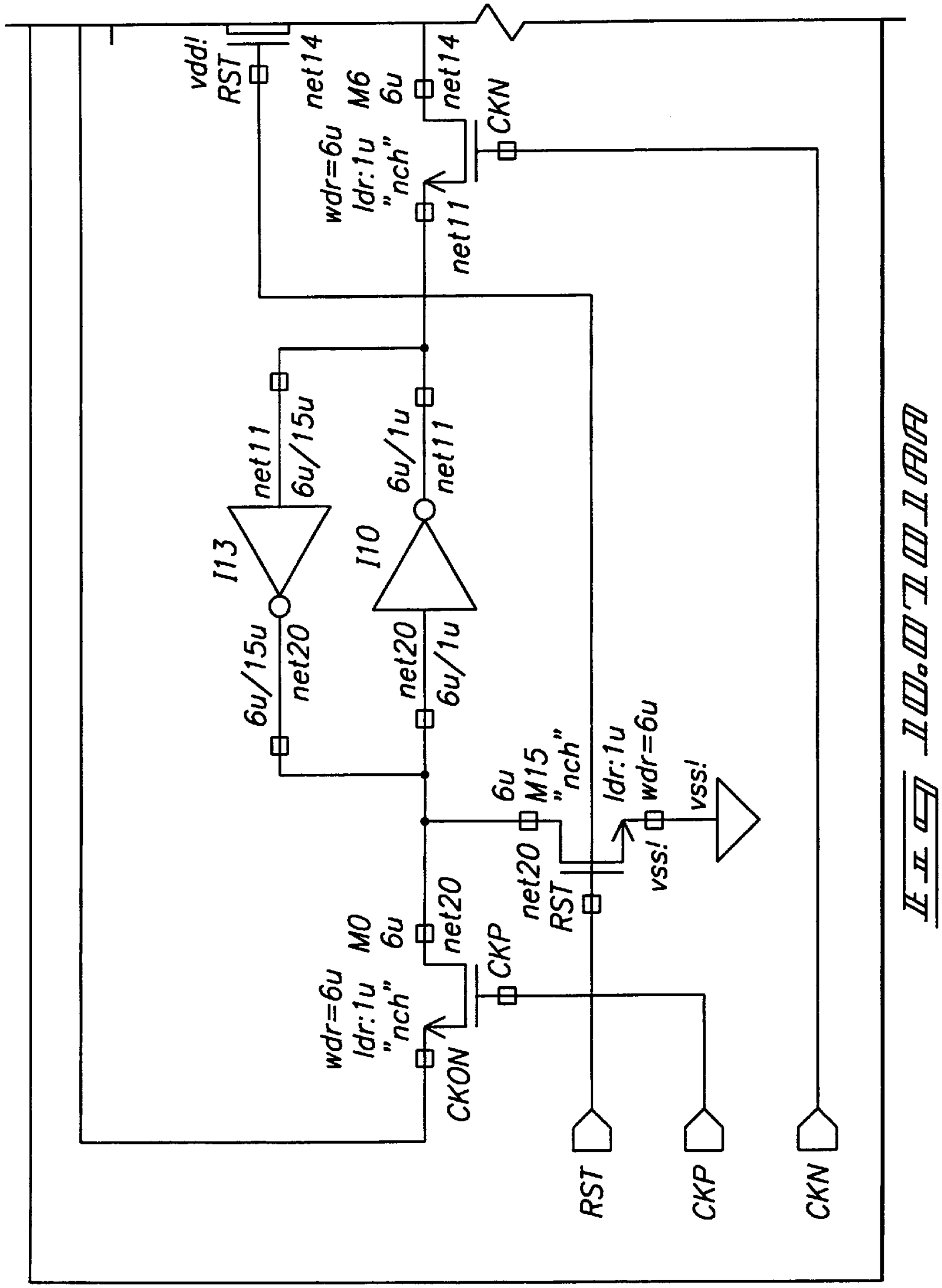
FIG. 10.07.01AA

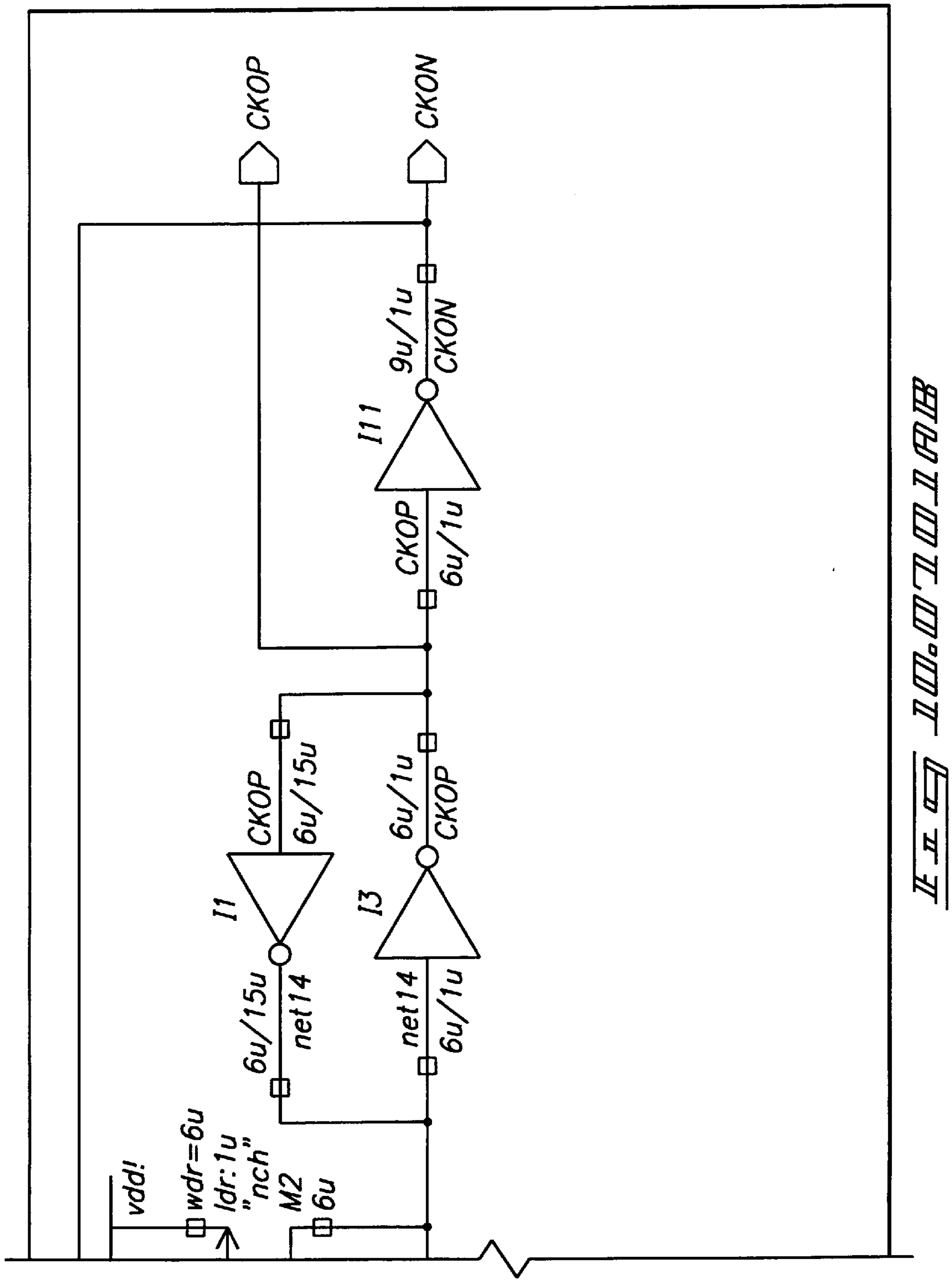
Fig. 10.01AB

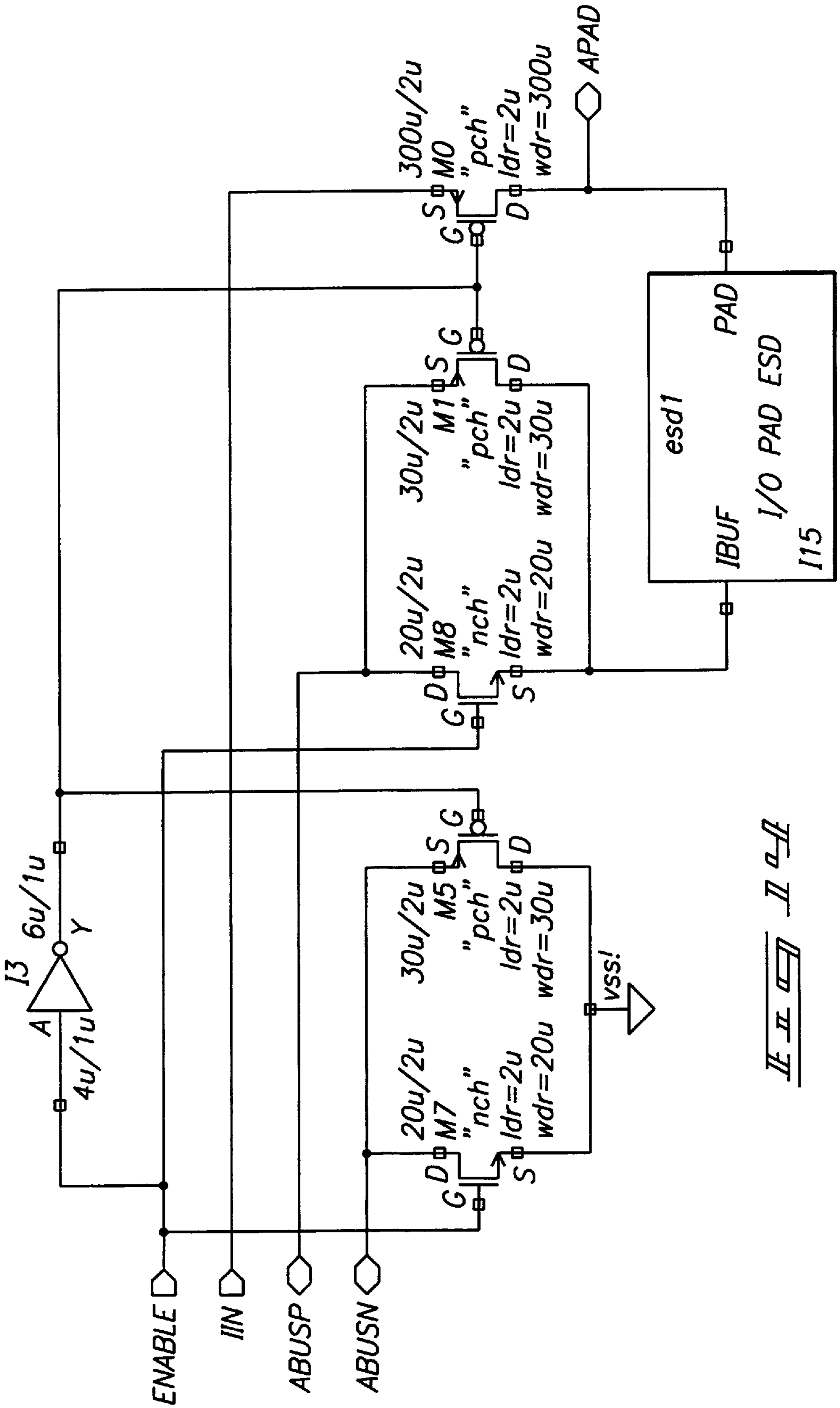
APAD
300u/2u
M0
"pch"
ldr=2u
wdr=300u
S
G
D
30u/2u
M1
"pch"
ldr=2u
wdr=30u
20u/2u
M8
"nch"
ldr=2u
wdr=20u
esd1
PAD
I/O PAD ESD
IBUF
I15
I3
A
Y
4u/1u
6u/1u
30u/2u
M5
"pch"
ldr=2u
wdr=30u
vss!
20u/2u
M7
"nch"
ldr=2u
wdr=20u
ENABLE
IIN
ABUSP
ABUSN

| | | | | | | | |
|---|---|---|---|---|---|---|---|
| 16AA | 16AB | 16AC | 16AD | 16AE | 16AF | 16AG | 16AH |
| 16BA | 16BB | 16BC | 16BD | 16BE | 16BF | 16BG | 16BH |
| 16CA | 16CB | 16CC | 16CD | 16CE | 16CF | 16CG | 16CH |
| 16DA | 16DB | 16DC | 16DD | 16DE | 16DF | 16DG | 16DH |
| 16EA | 16EB | 16EC | 16ED | 16EE | 16EF | 16EG | 16EH |

FIG. 16

| | | | | | | | | |
|---|---|---|---|---|---|---|---|---|
| 16.01AA | 16.01AB | 16.01AC | 16.01AD | 16.01AE | 16.01AF | 16.01AG | | |
| 16.01BA | 16.01BB | 16.01BC | 16.01BD | 16.01BE | 16.01BF | 16.01BG | 16.01BH | 16.01BI |
| 16.01CA | 16.01CB | 16.01CC | 16.01CD | 16.01CE | 16.01CF | 16.01CG | 16.01CH | 16.01CI |
| 16.01DA | 16.01DB | 16.01DC | 16.01DD | 16.01DE | 16.01DF | 16.01DG | 16.01DH | 16.01DI |

Fig. 16.01

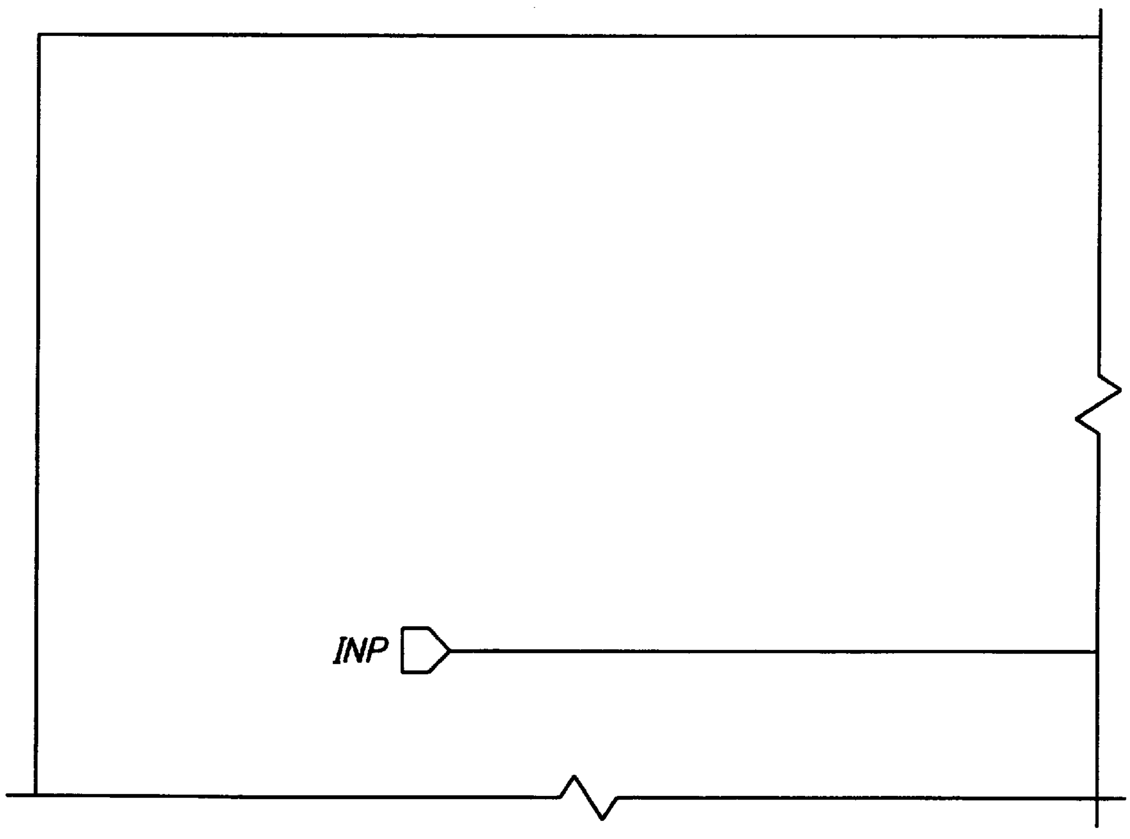
Fig. 16.01AA

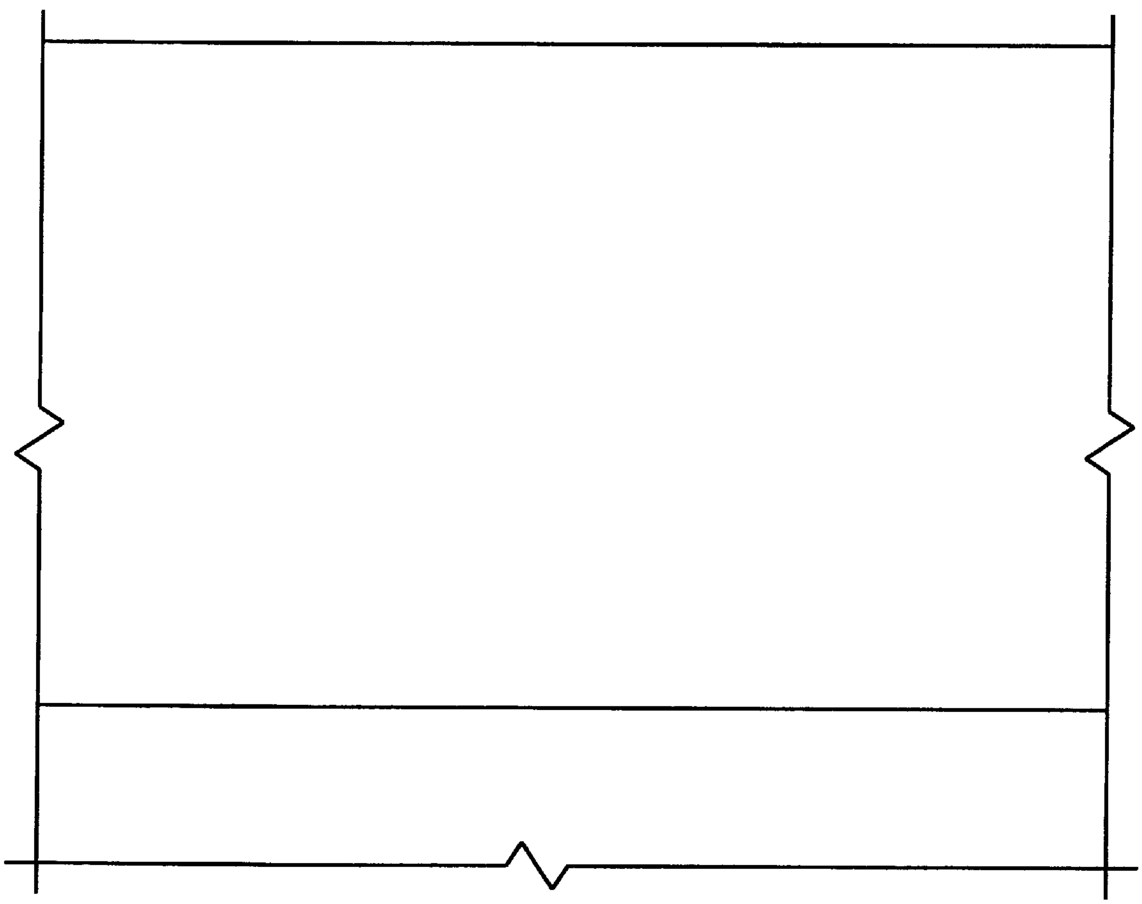
Fig. 16.01AB

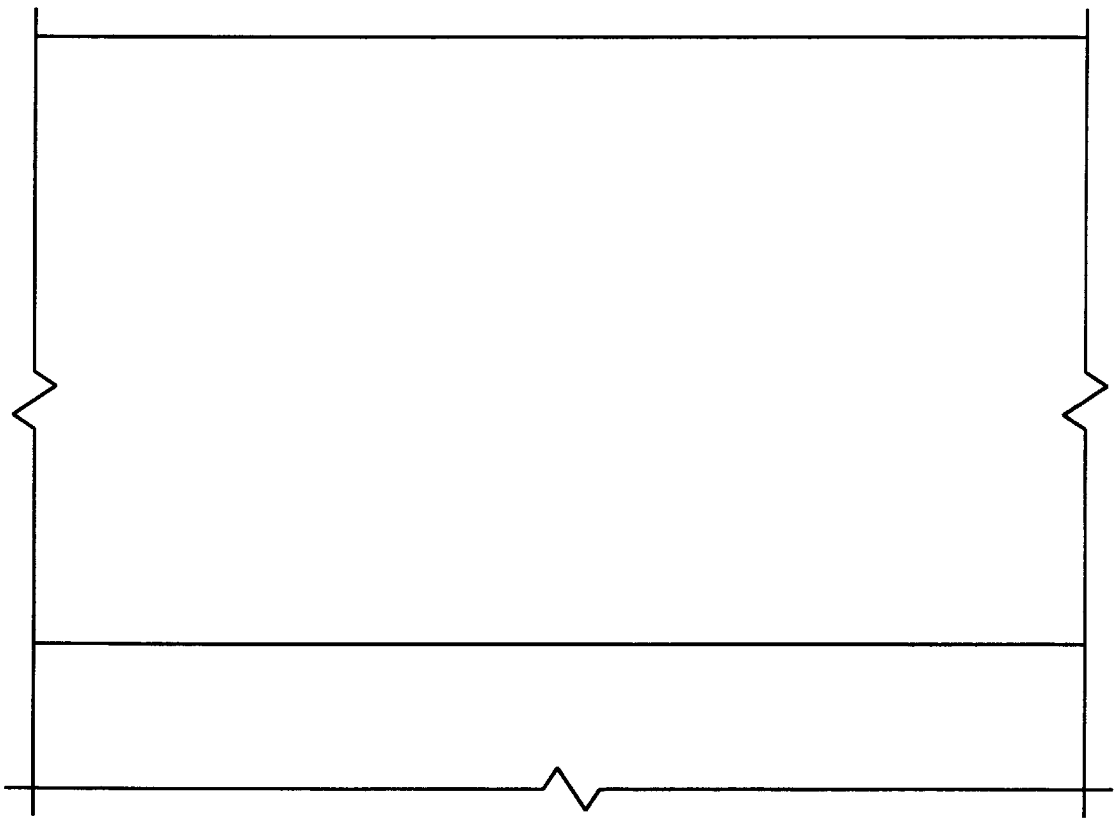
Fig 16.01AC

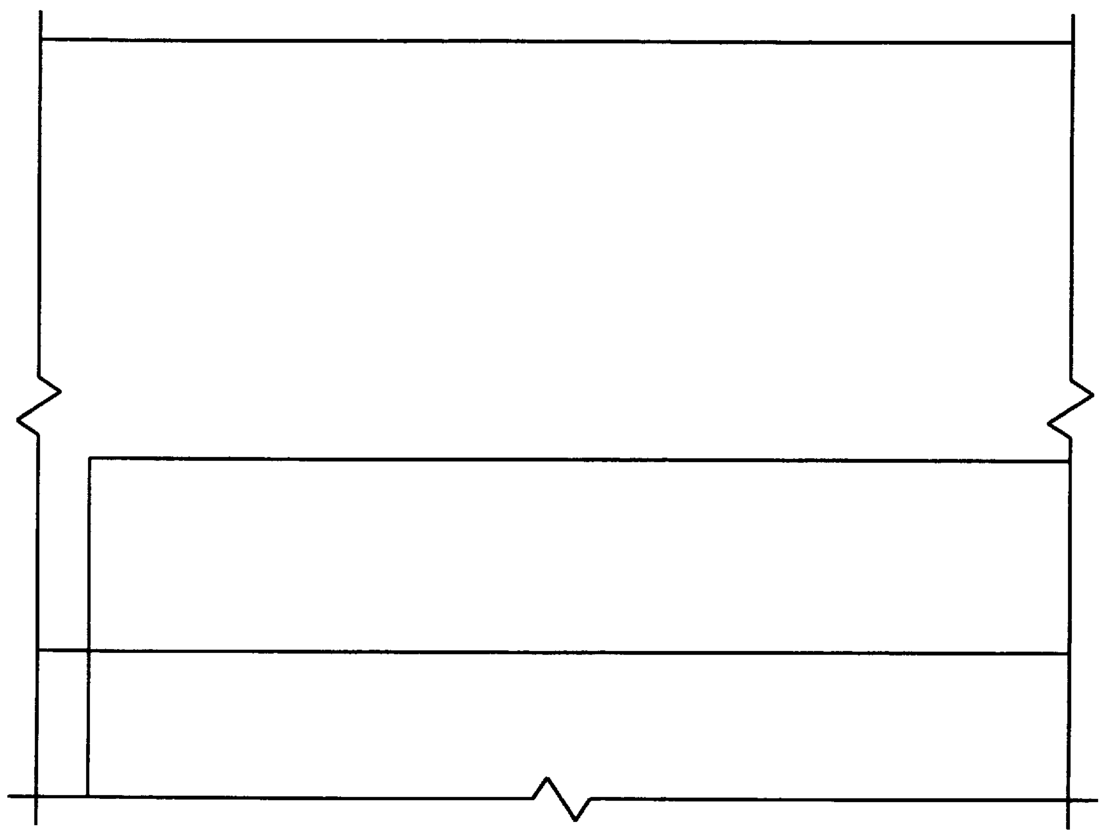
Fig 16.01AD

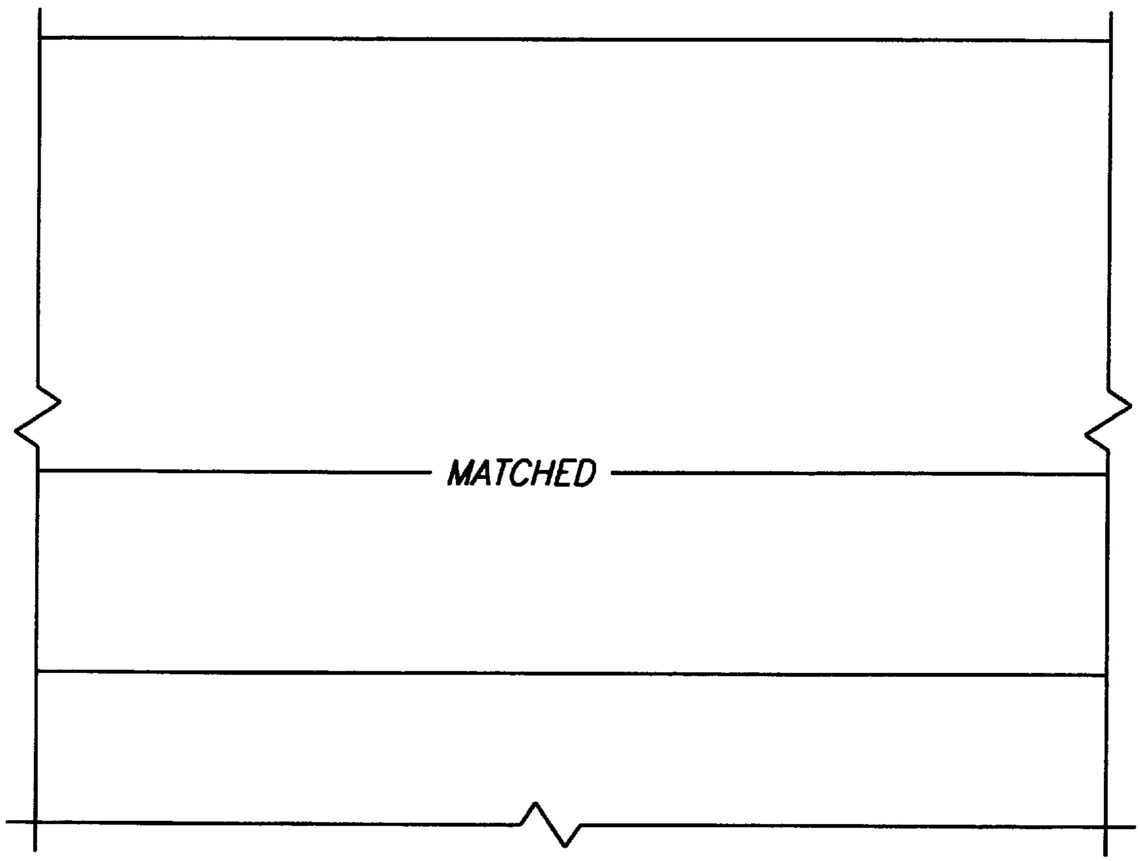
Fig 16.01AE

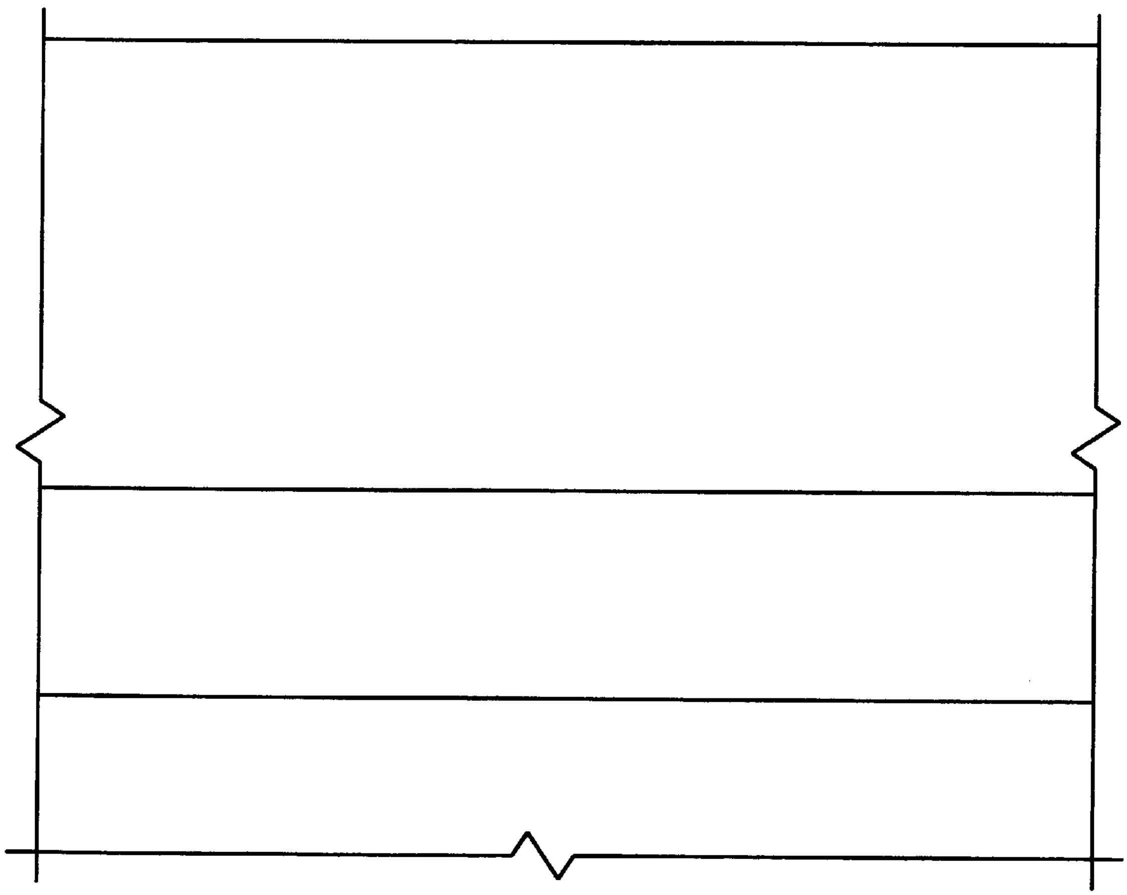
FIG. 16.01AF

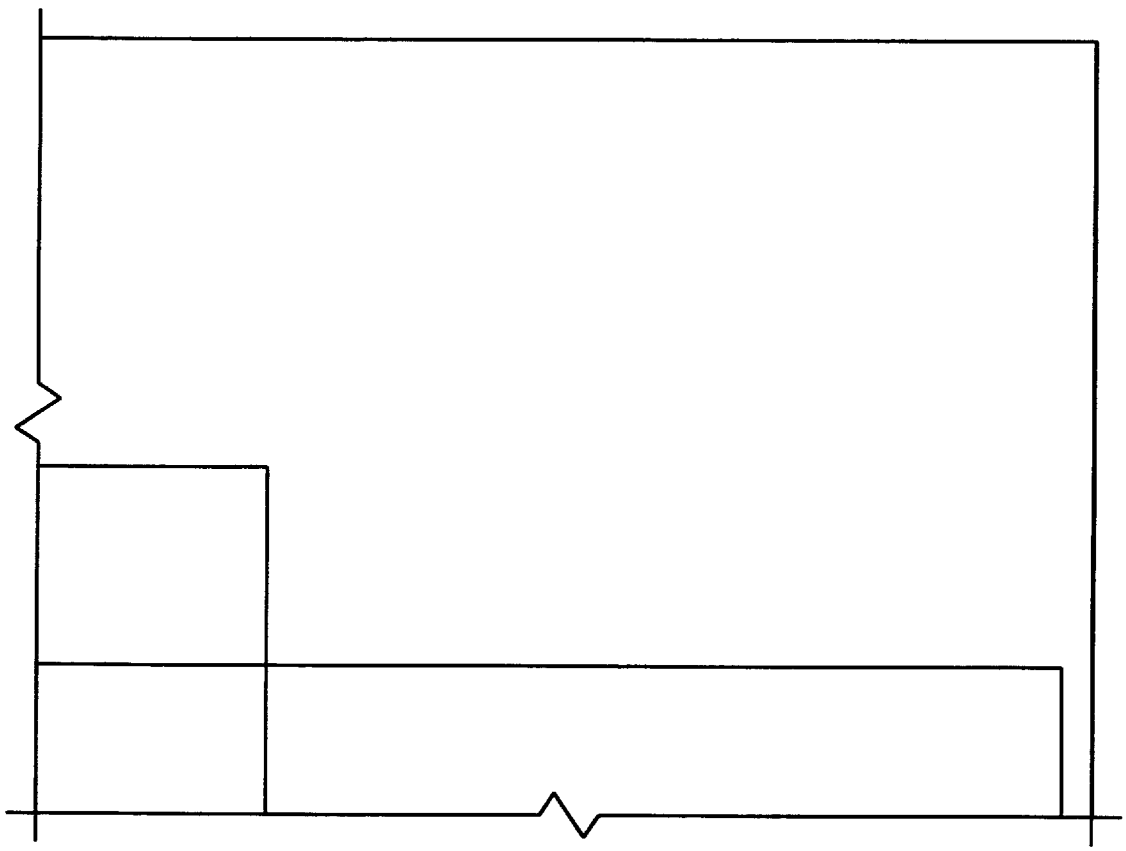
Fig 16.01AG

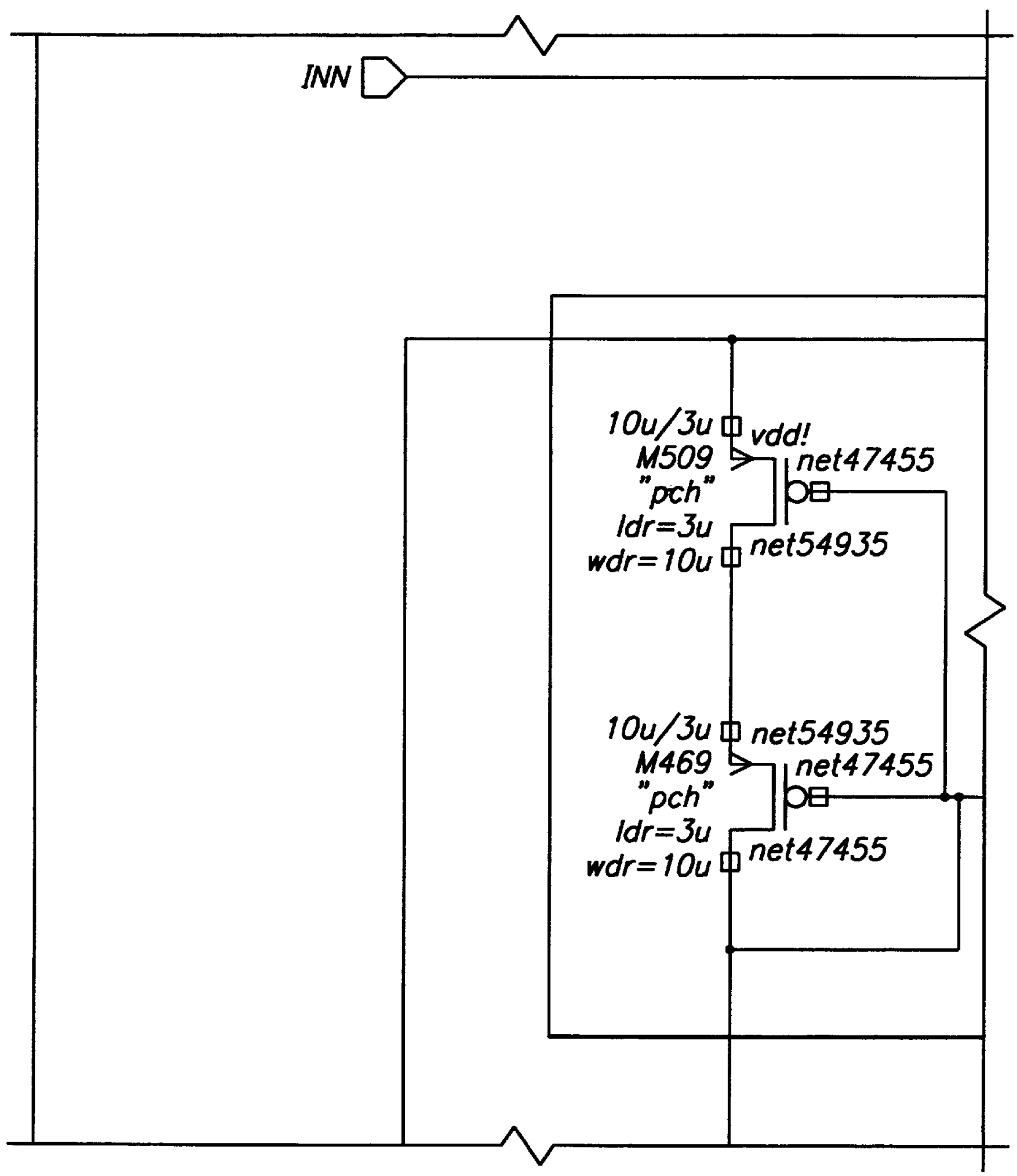
Fig 16.01BA

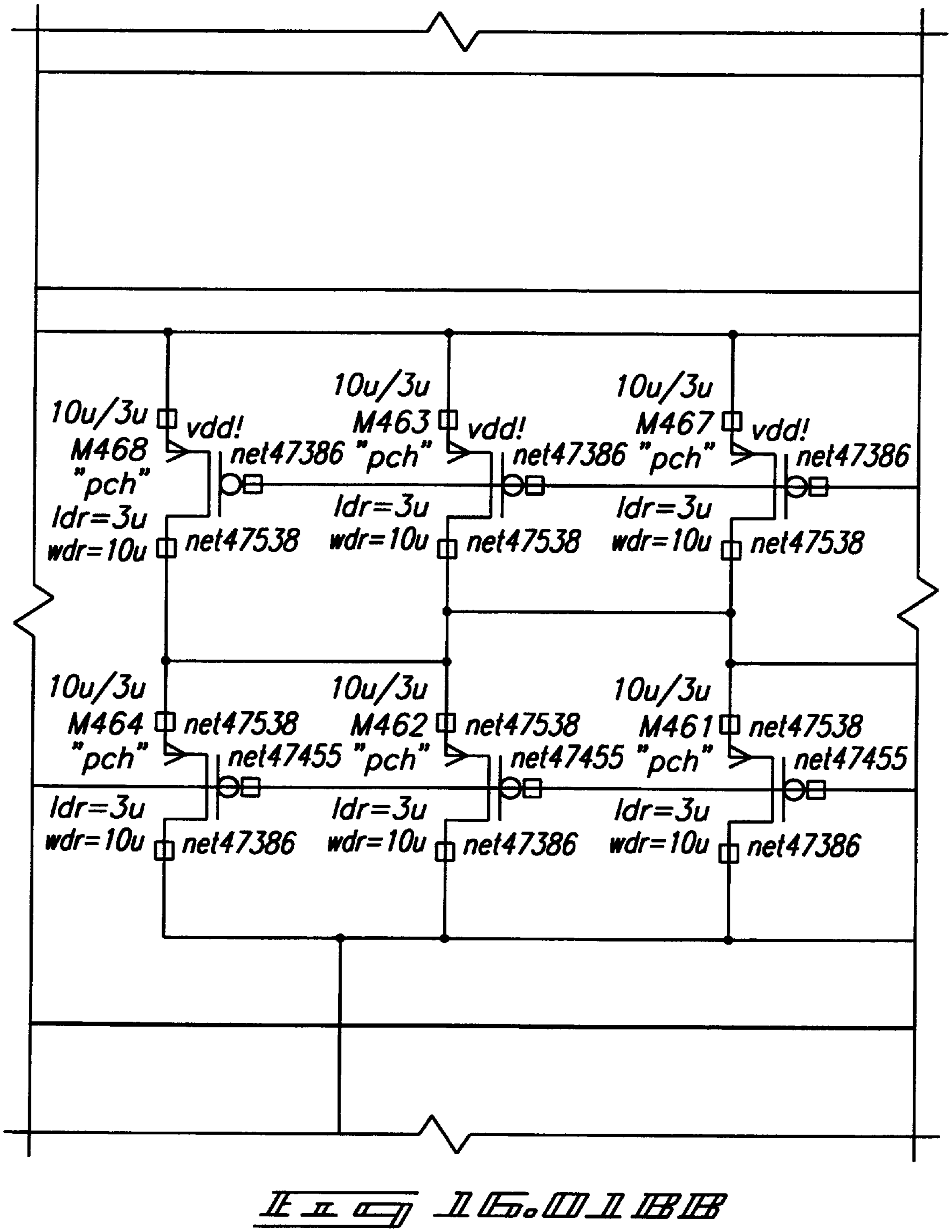
Fig 16.01BB

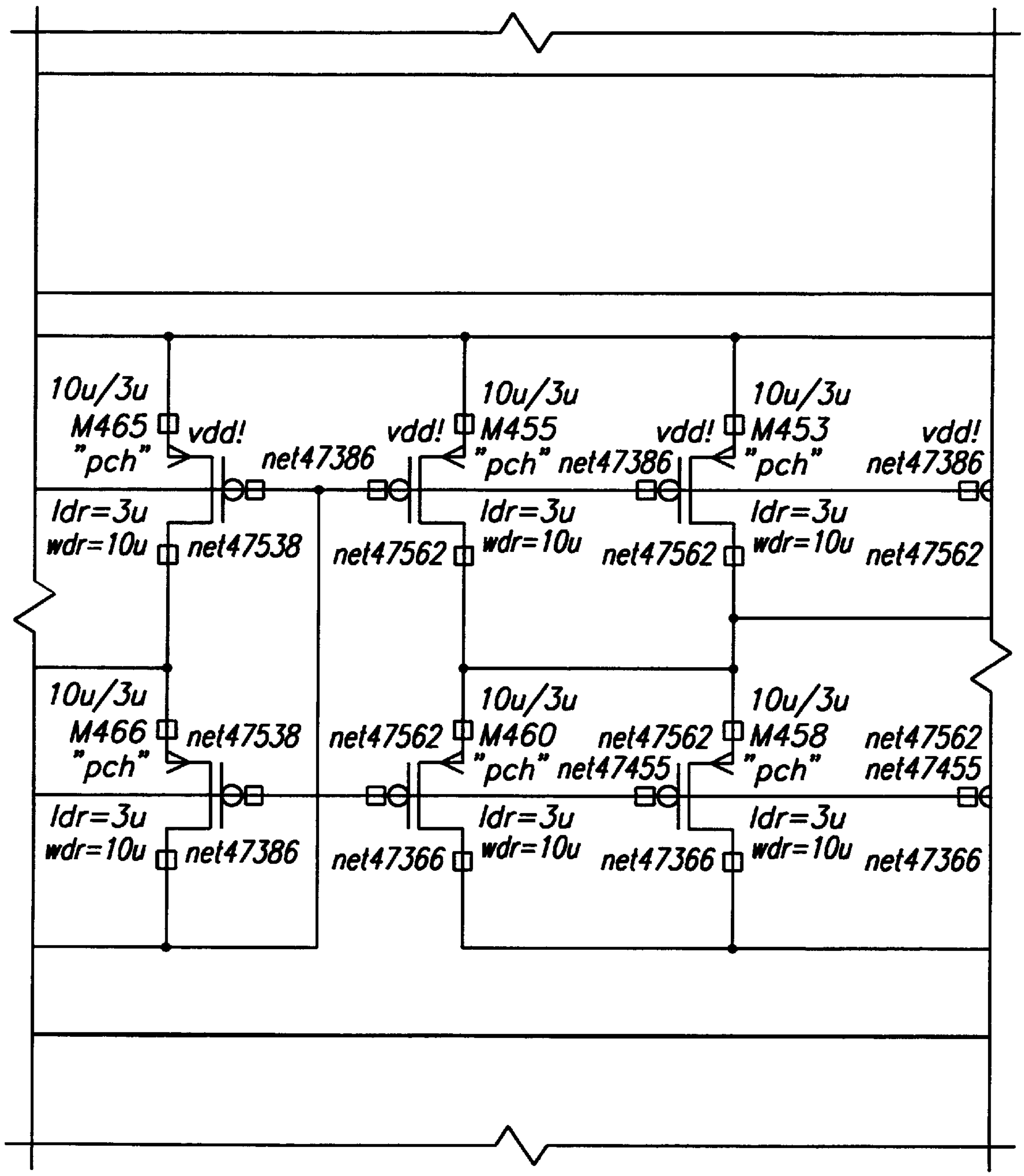
Fig 16.01BC

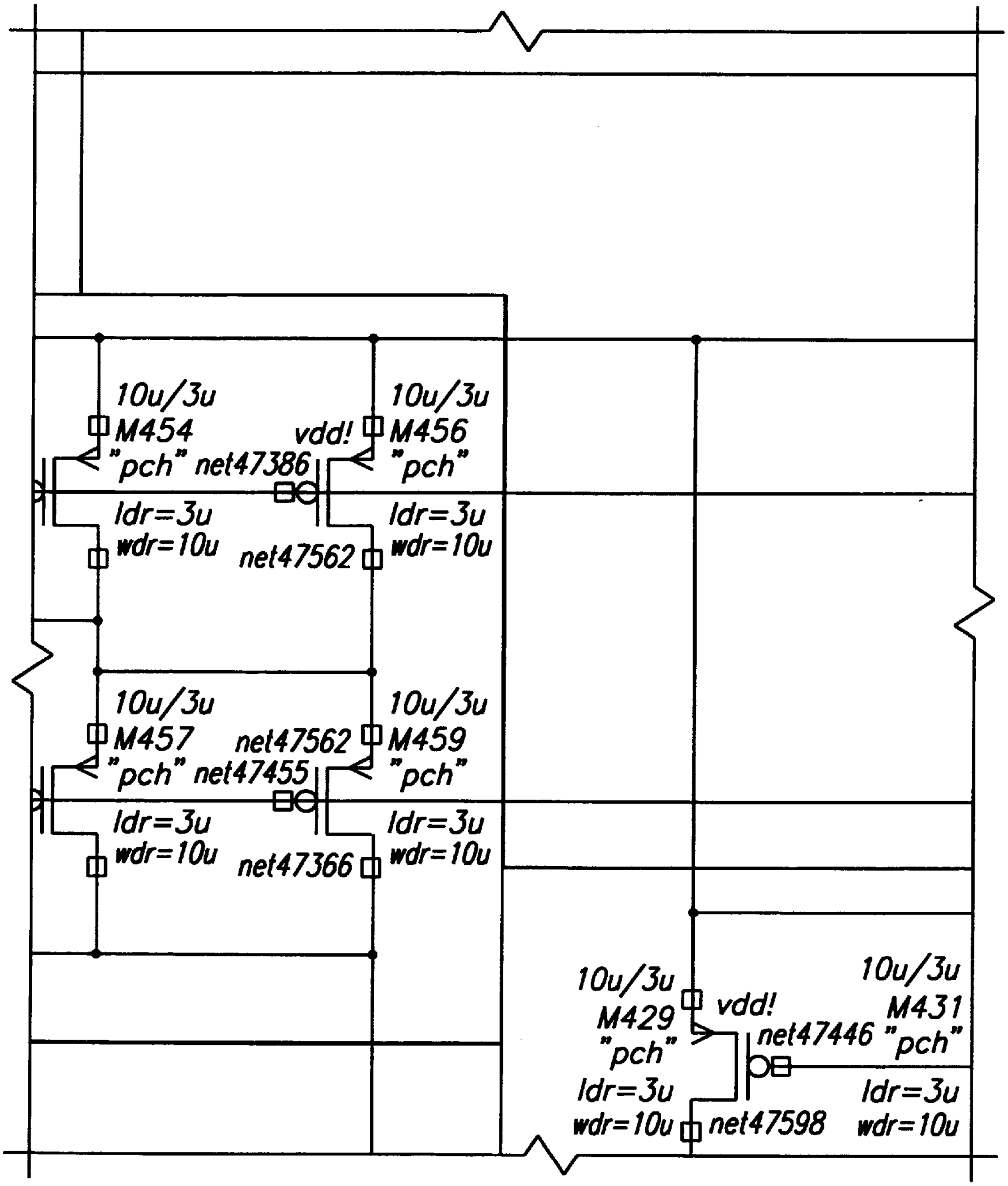
Fig 16.01BD

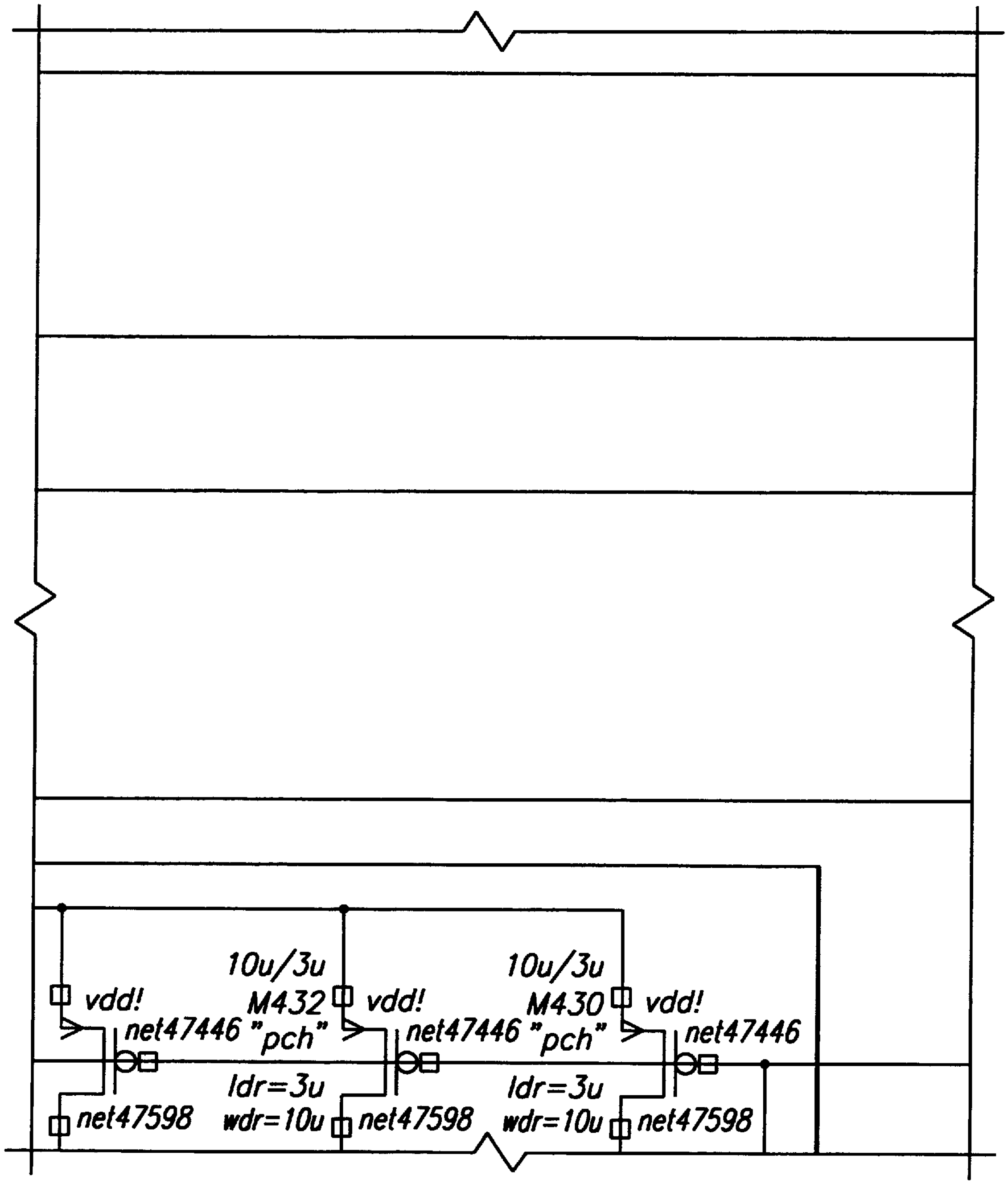
Fig 16.01BE

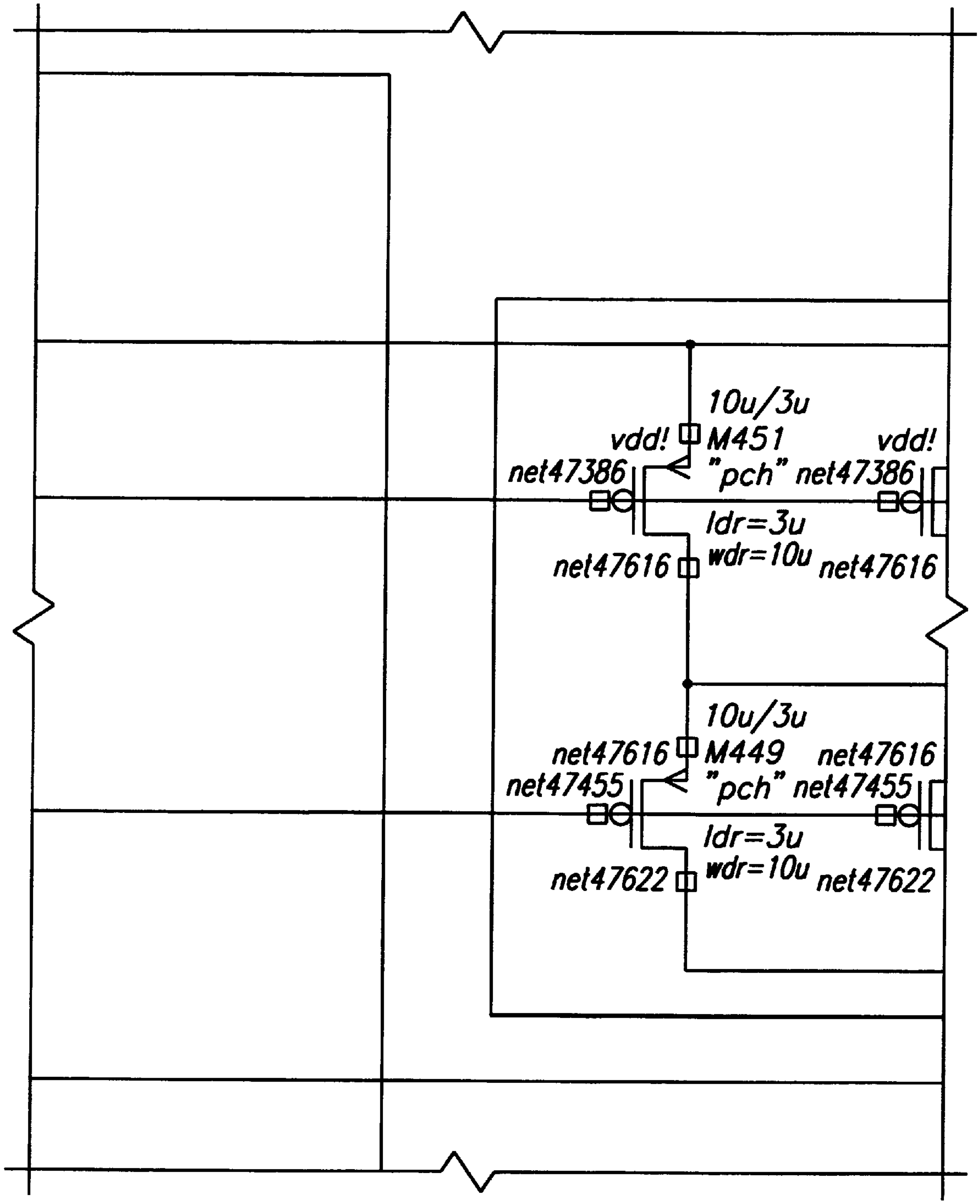
Fig 16.01BF

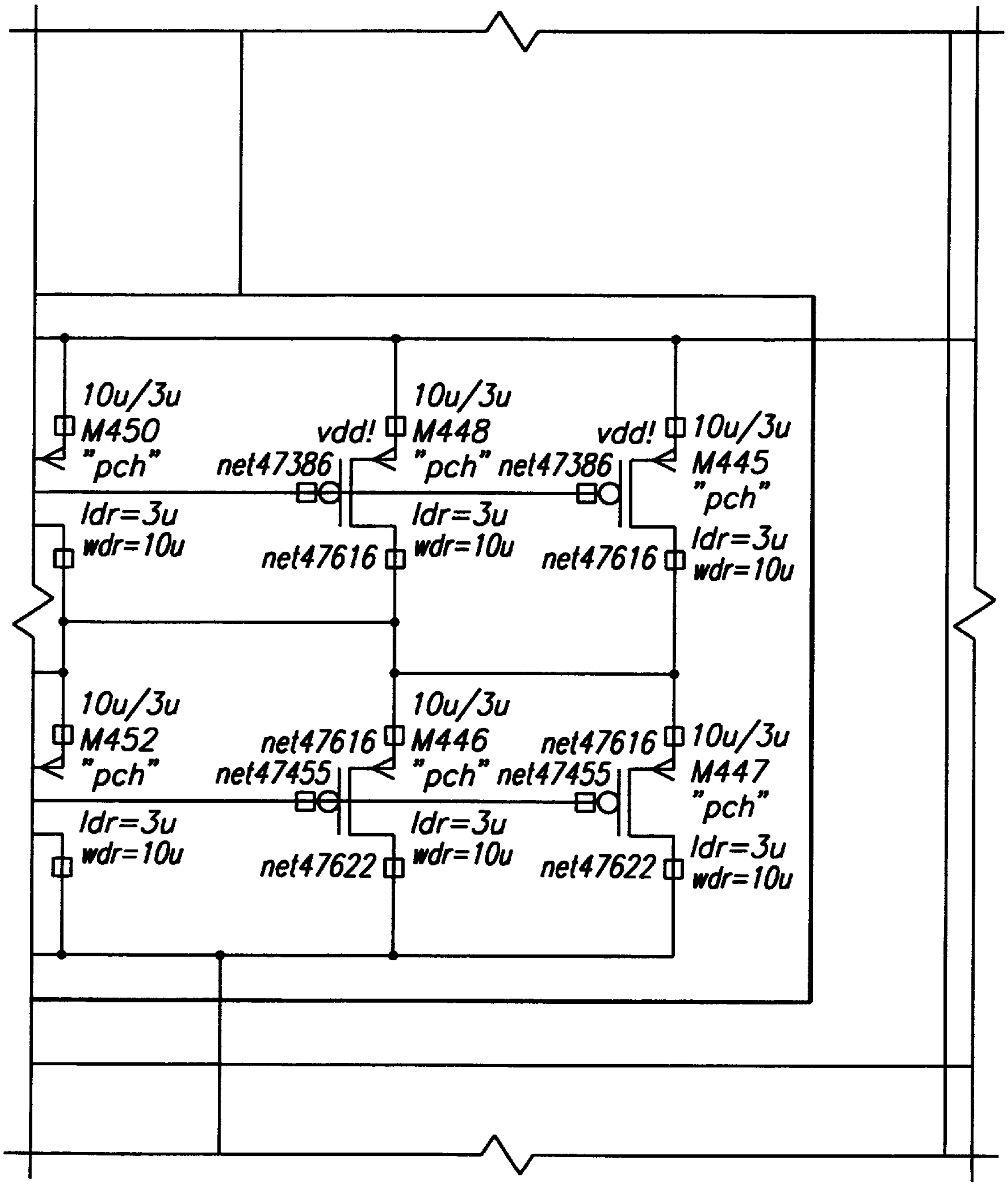
Fig 16.01BG

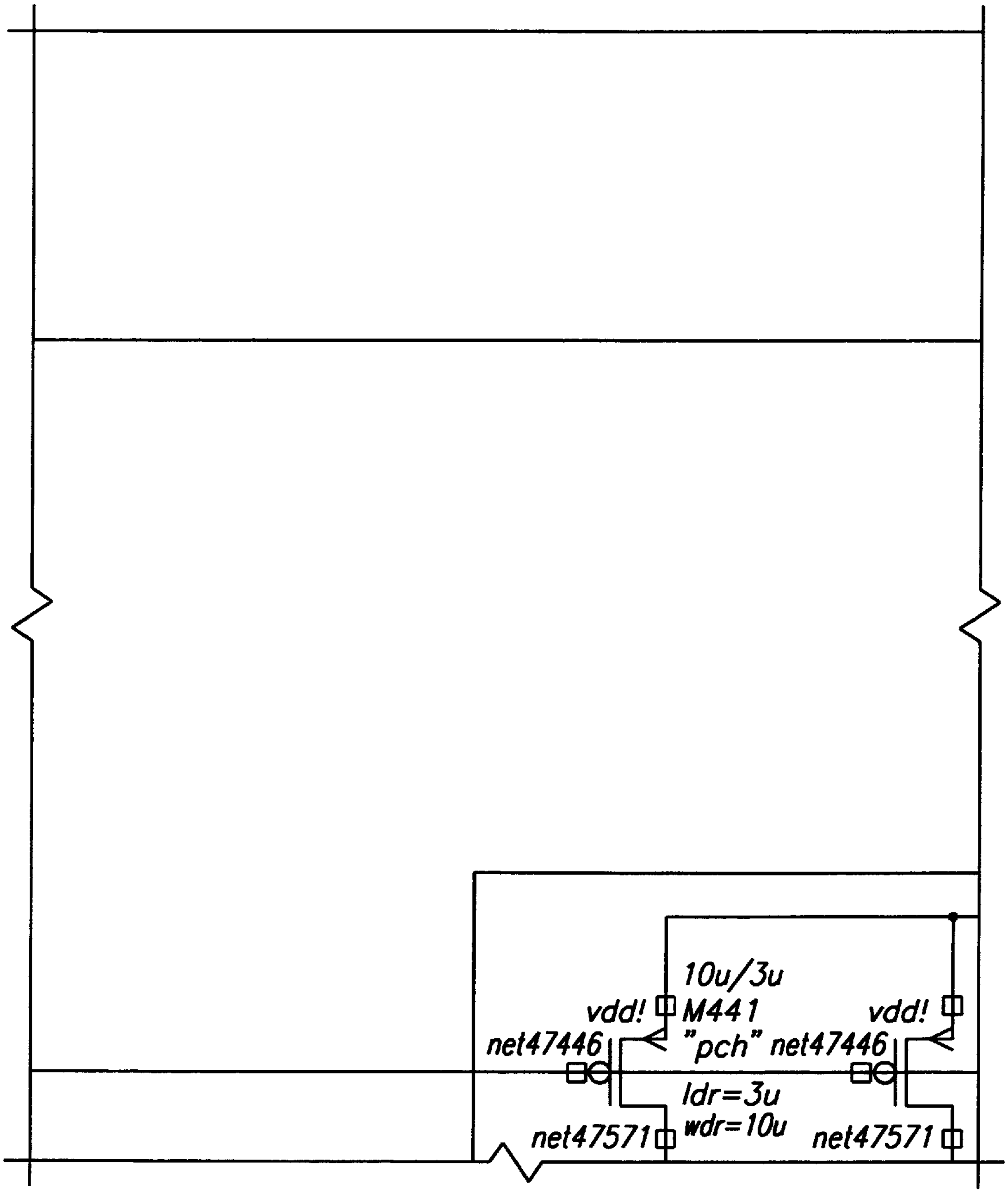
Fig 16.01BH

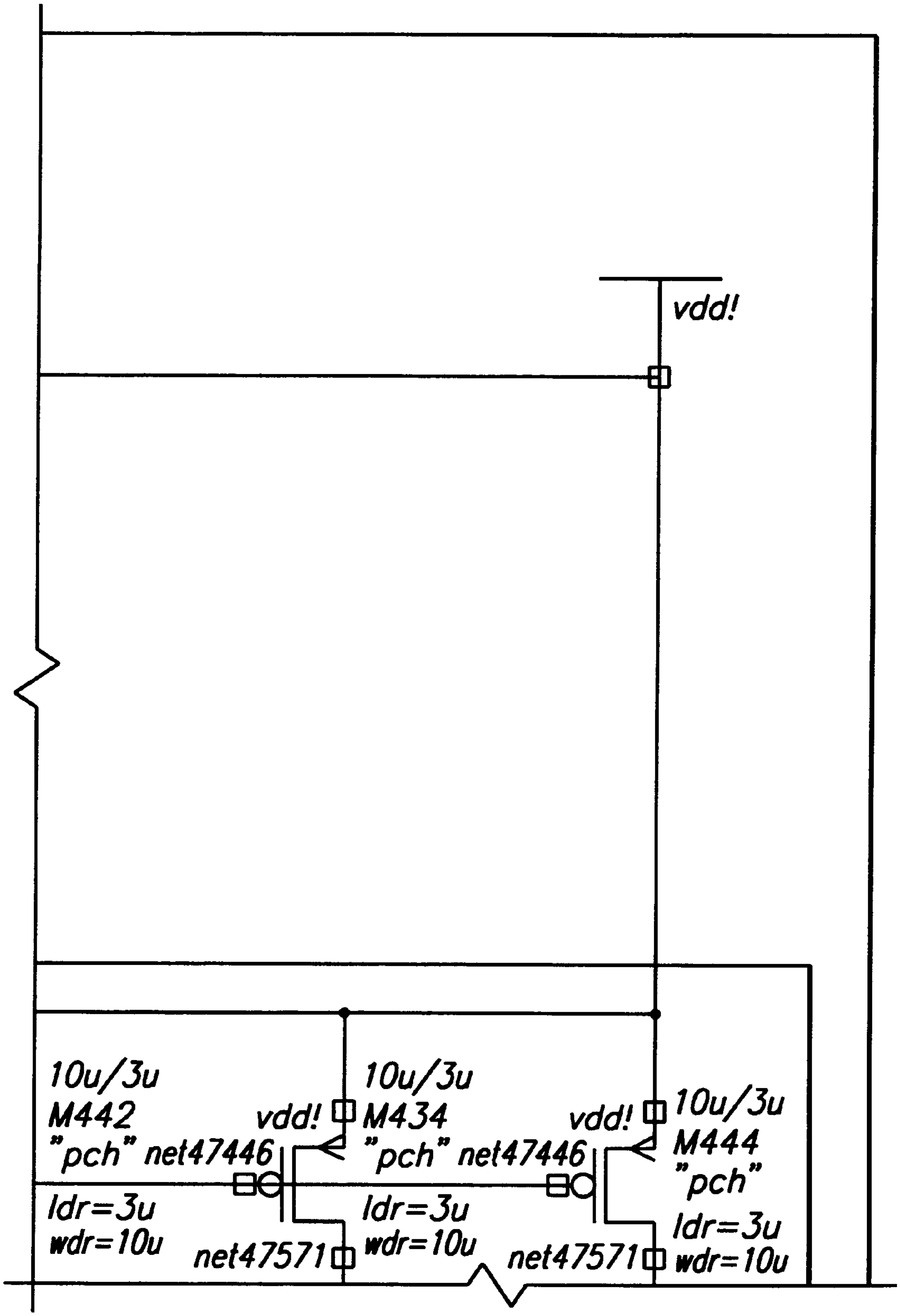
Fig 16.DIBI

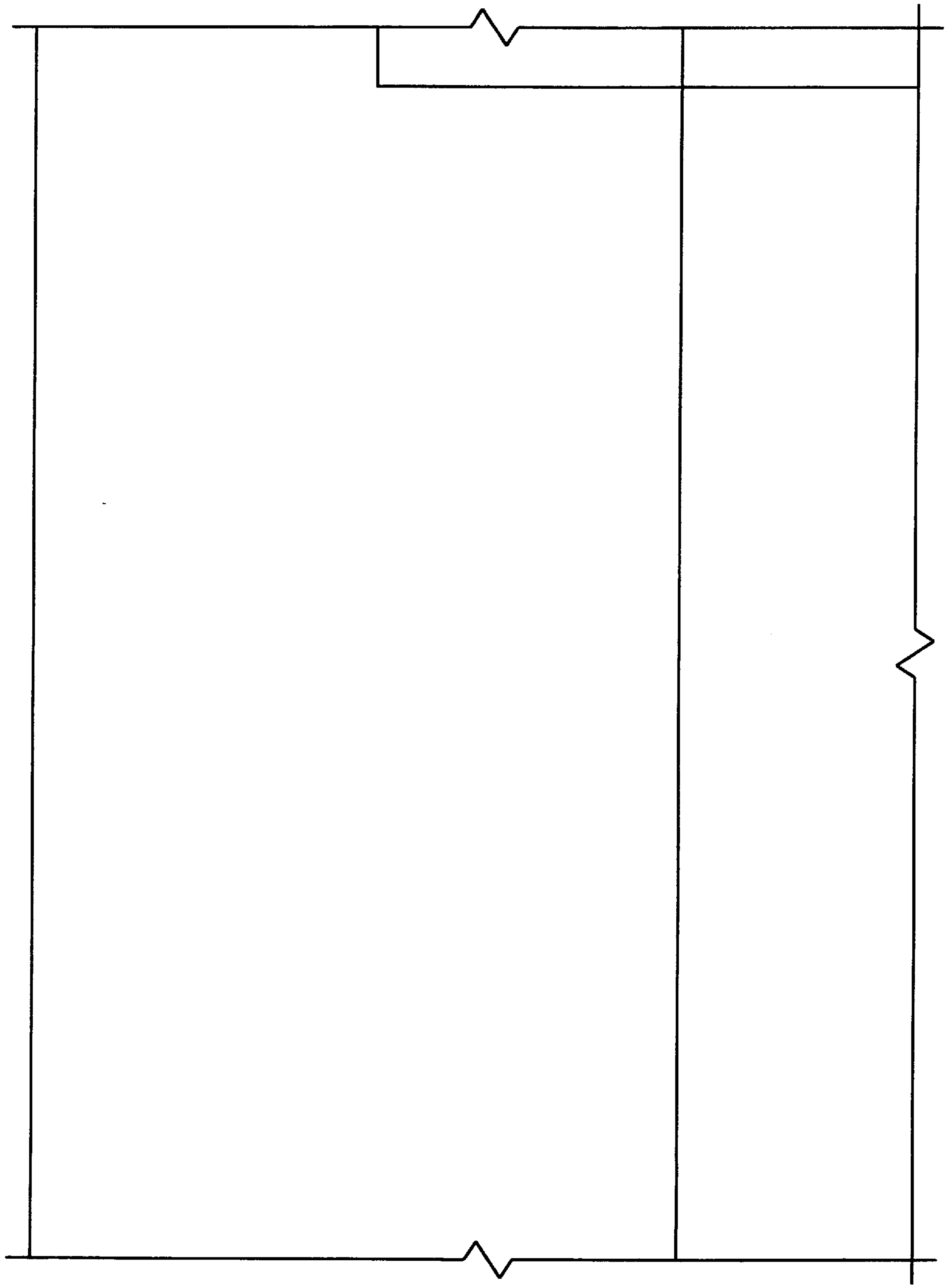
Fig 16.01CA

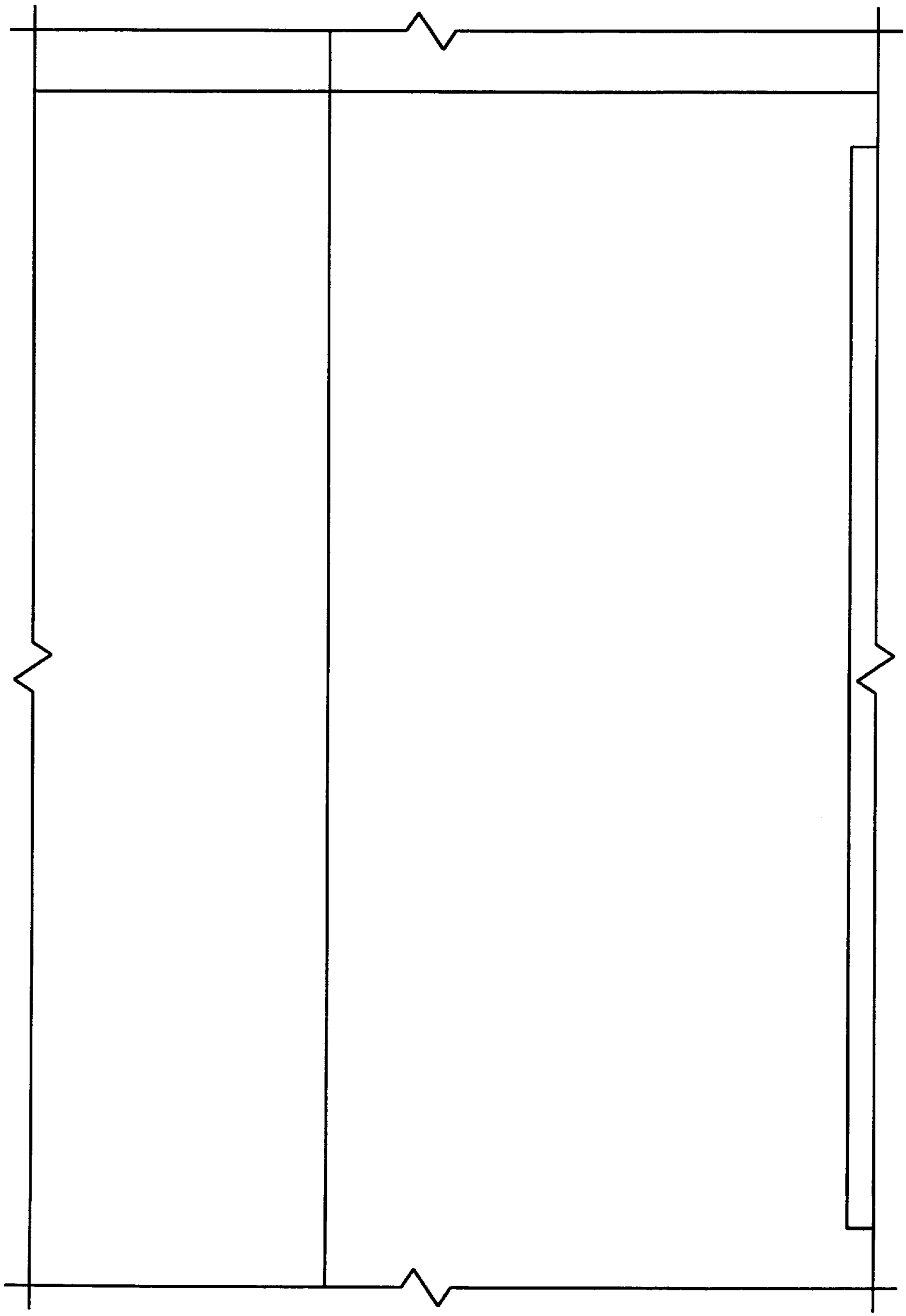
Fig 16.01CB

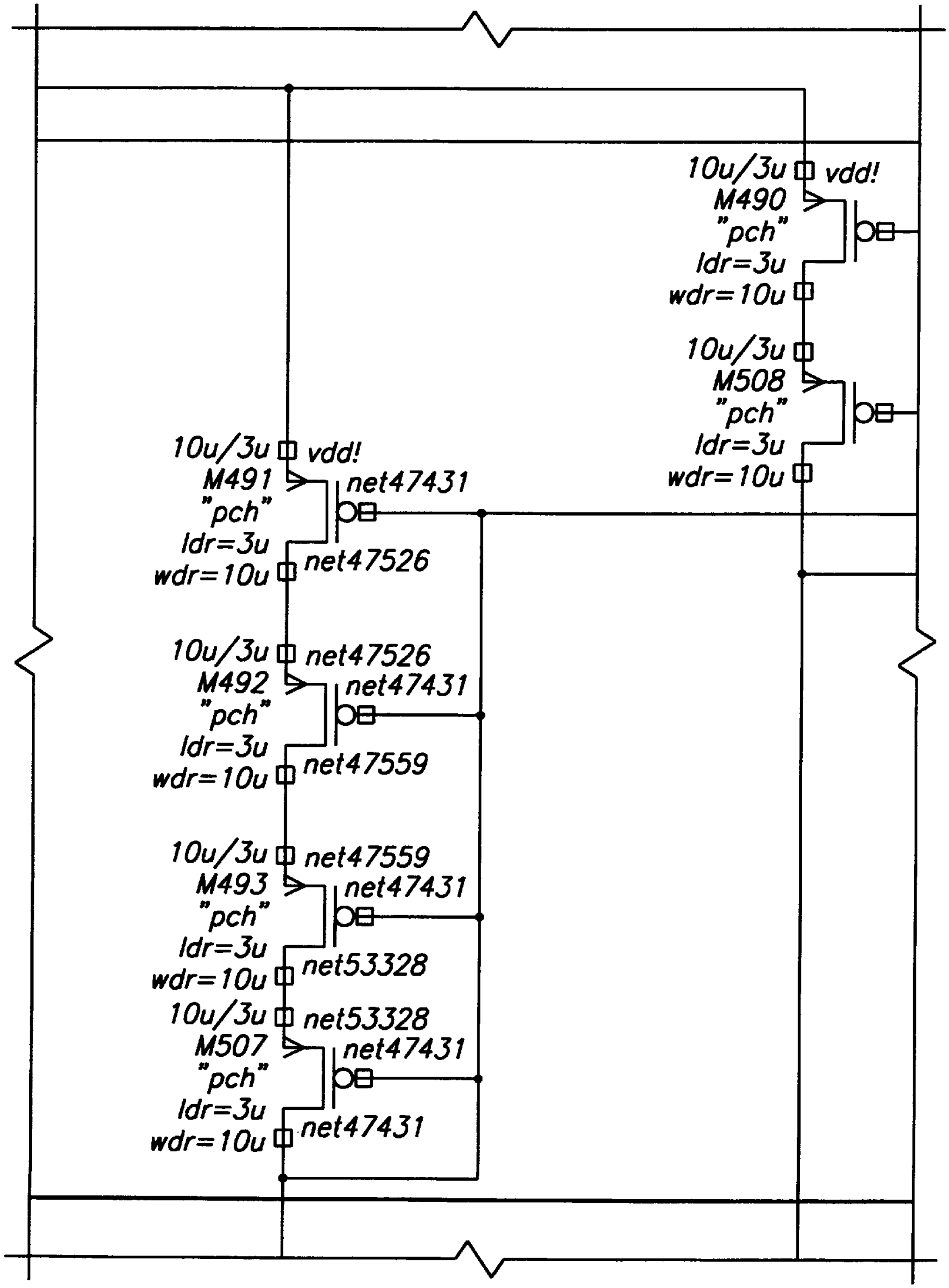
Fig 16.01CC

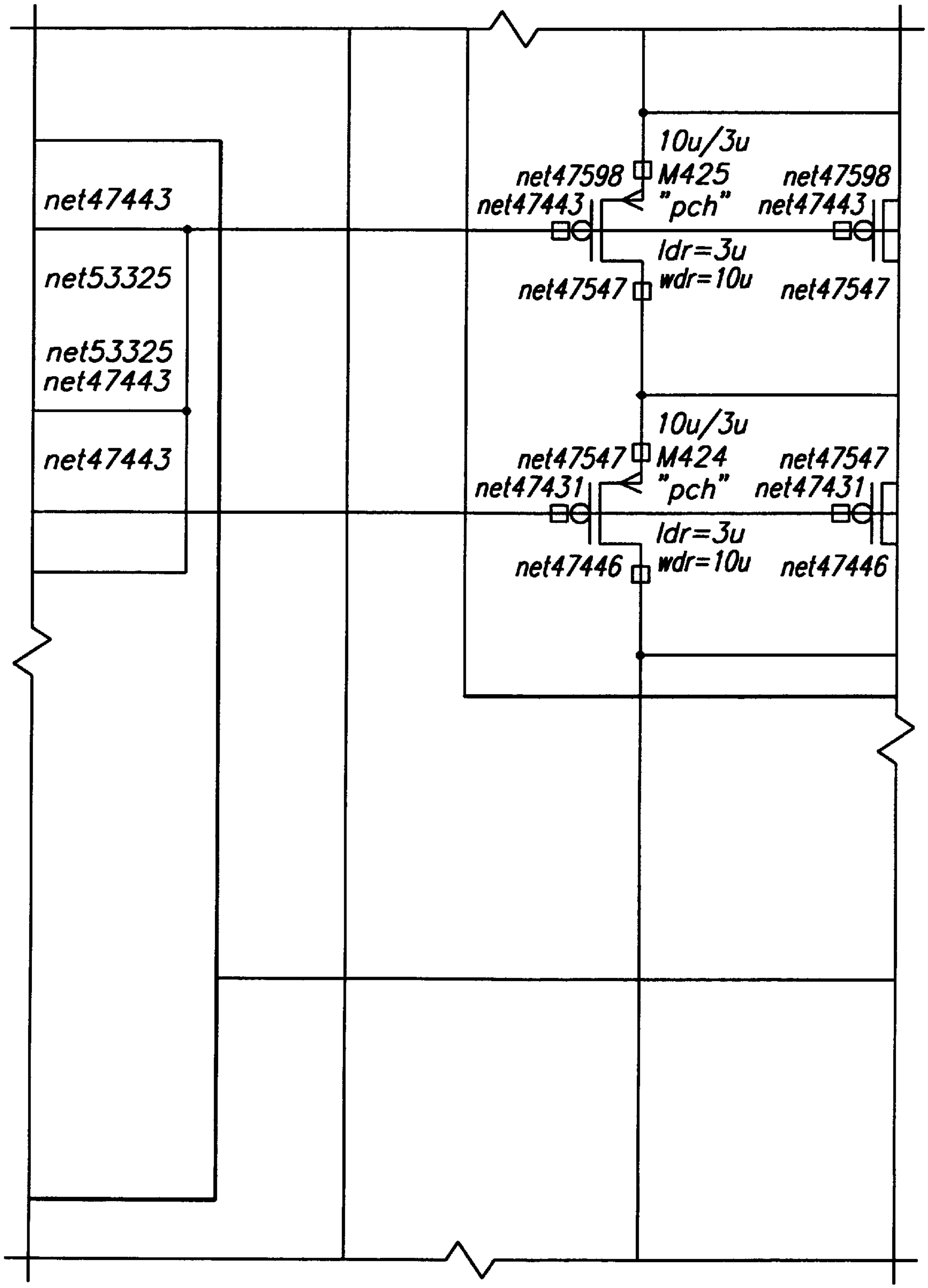
Fig 16.01CD

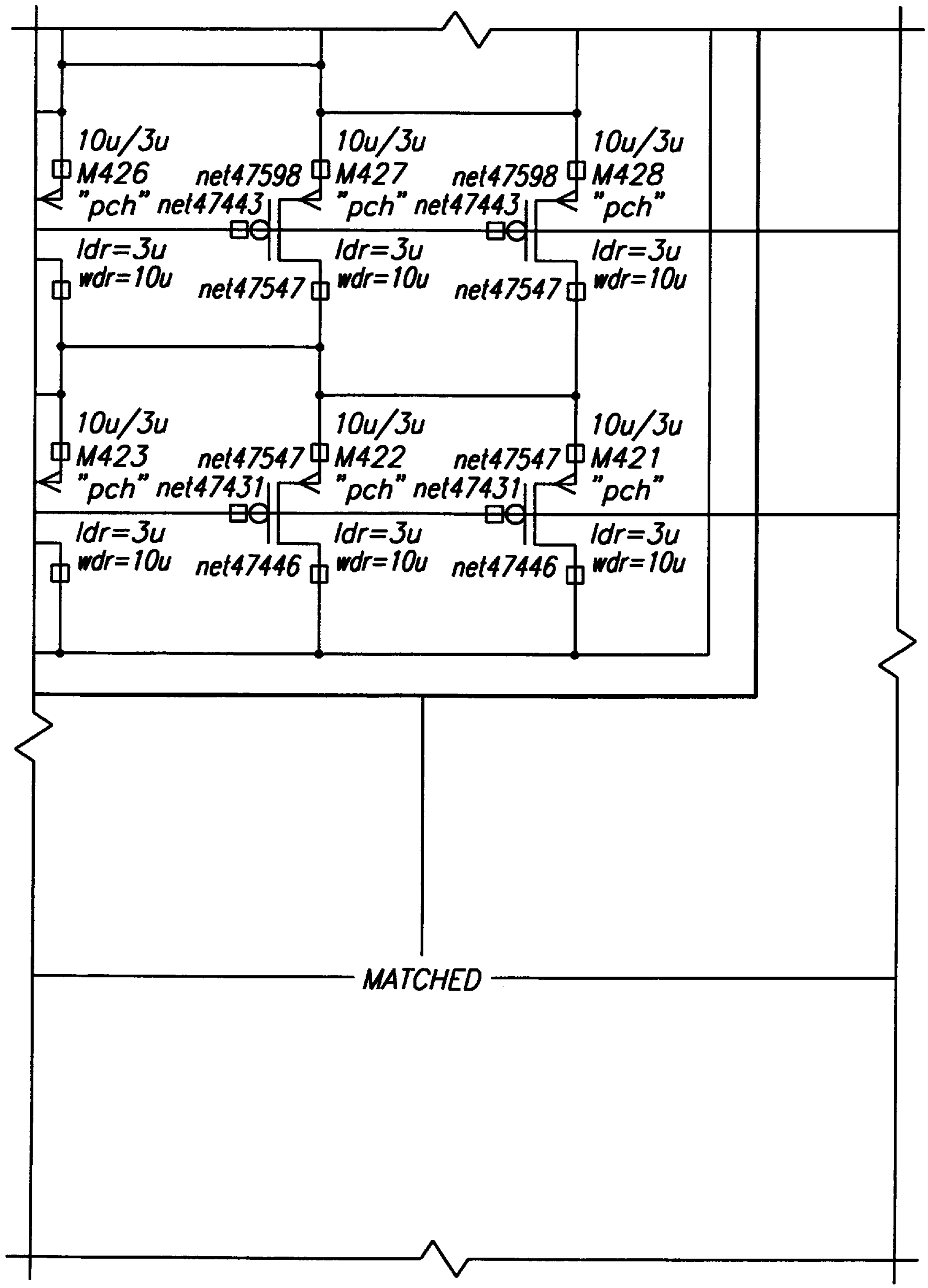
Fig 16.DICE

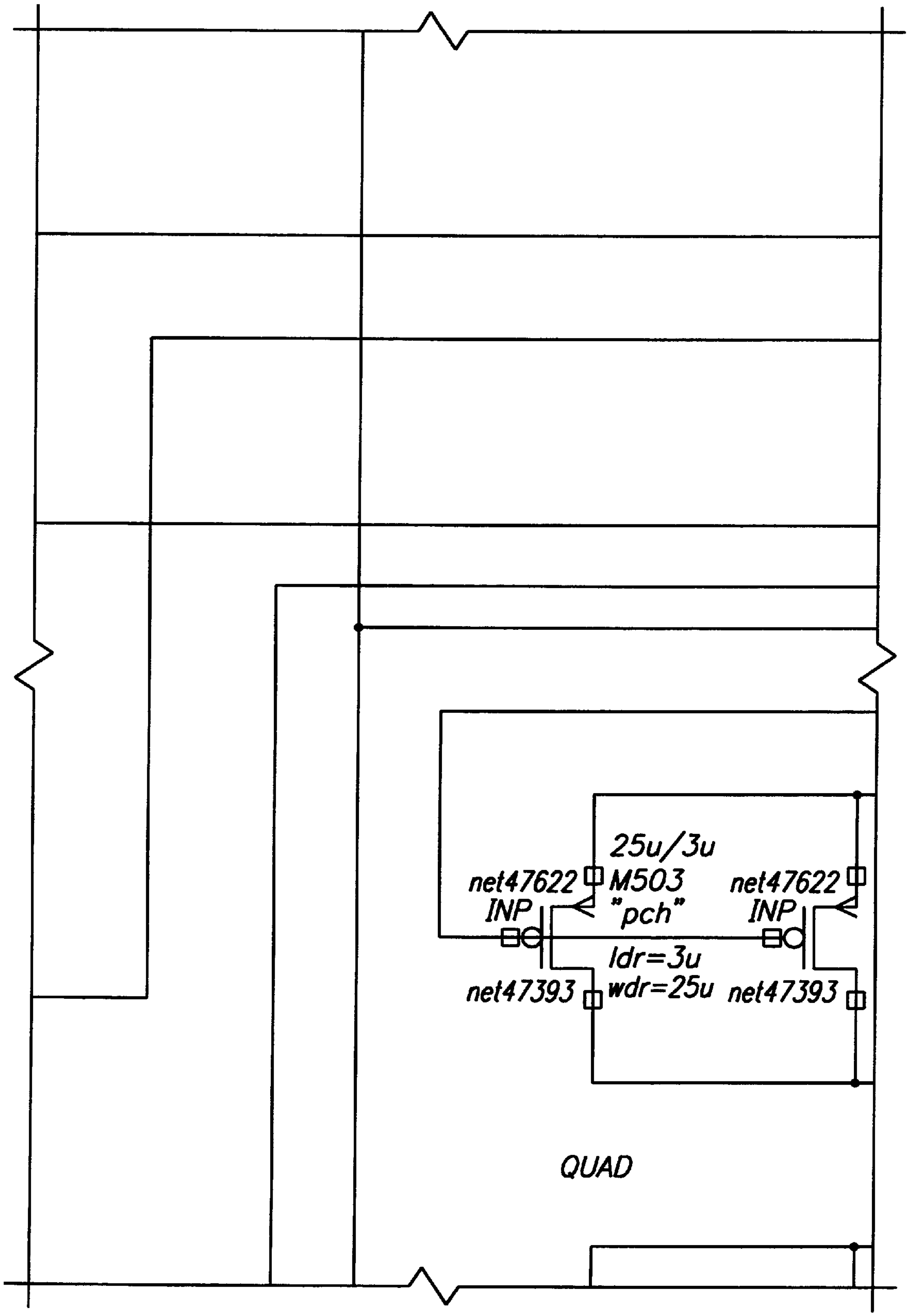
Fig 16.DICF

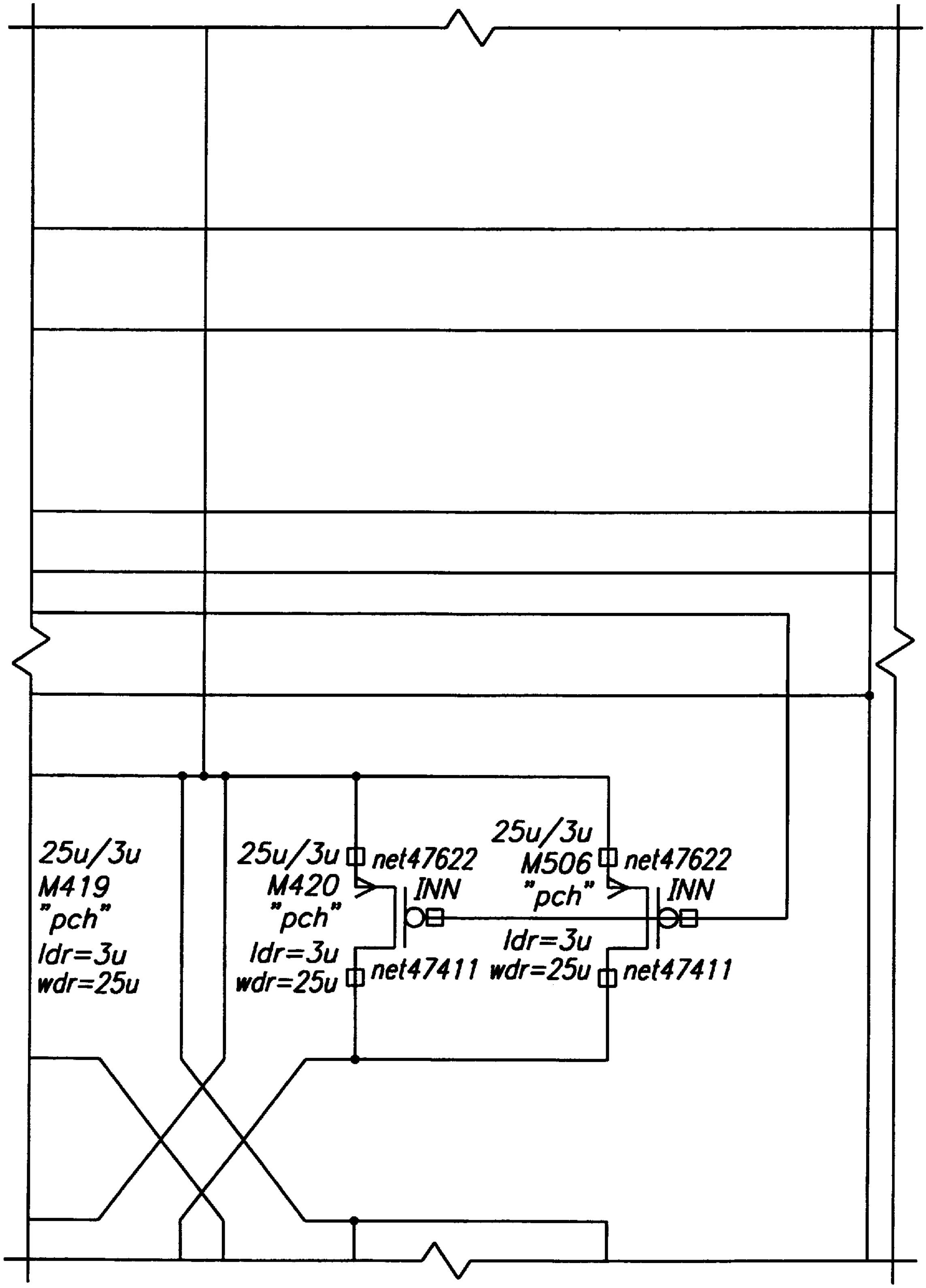
Fig 16.01CG

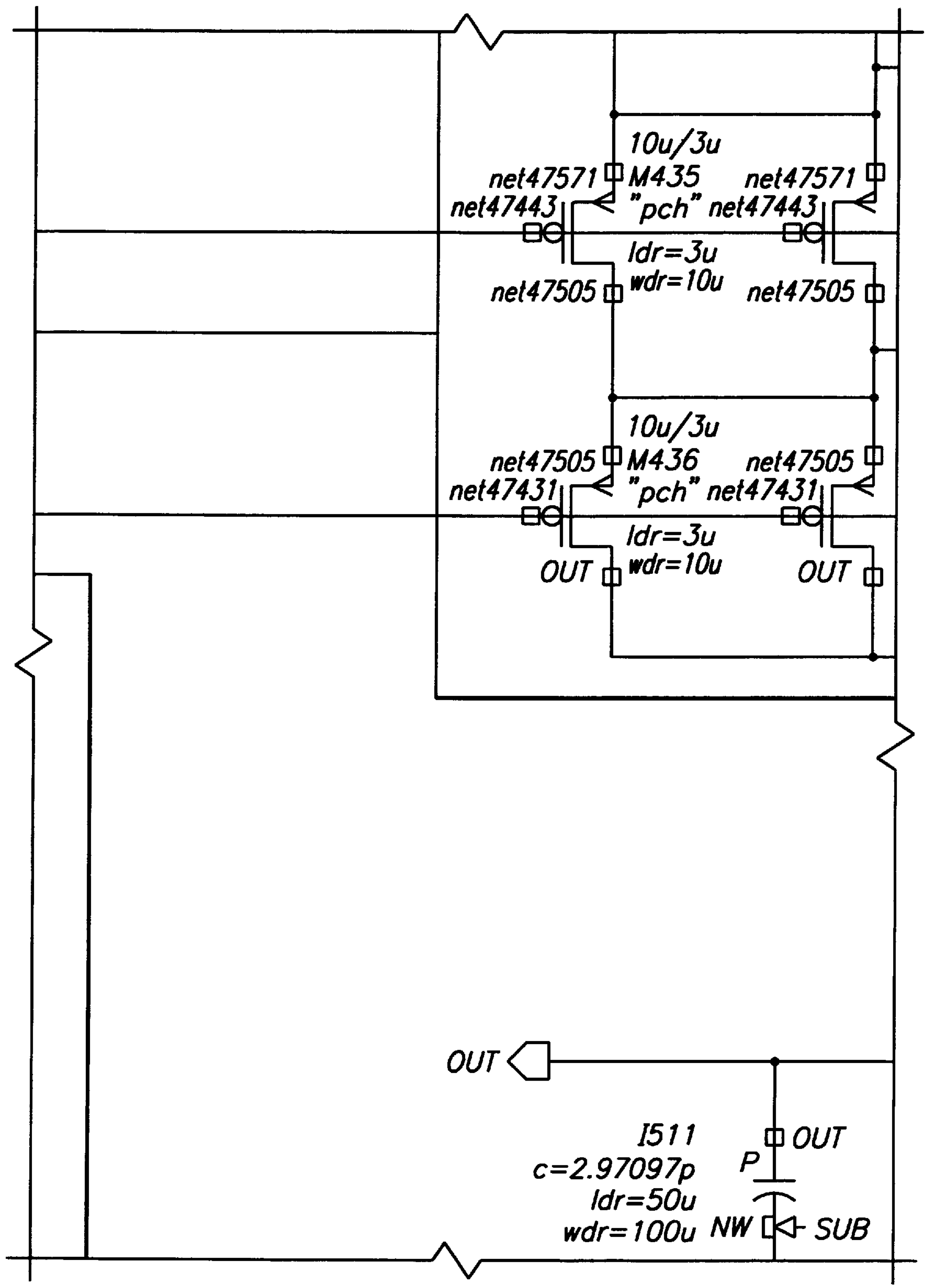
Fig 16.DICH

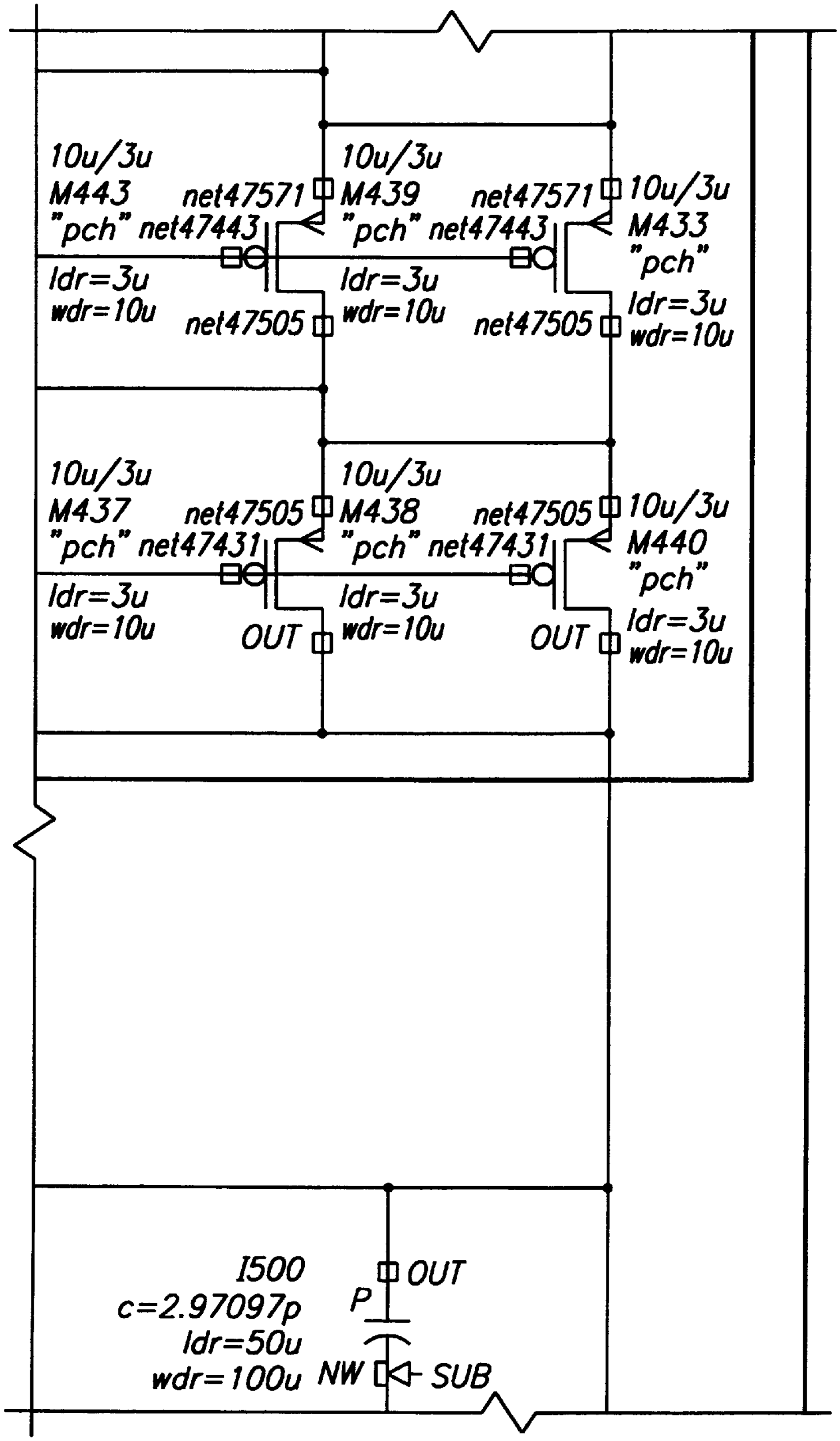
Fig 16.DICI

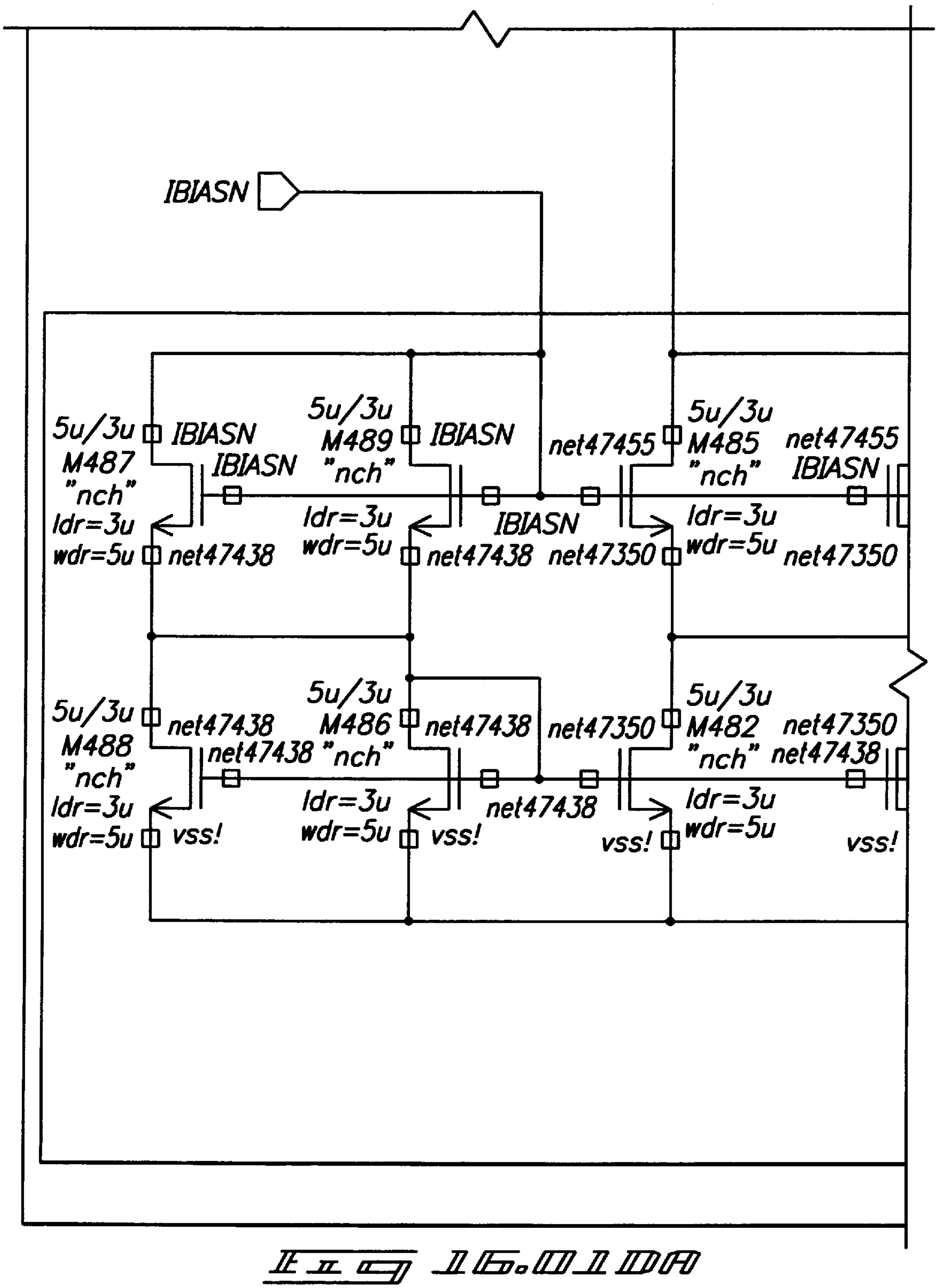
Fig 16.01DA

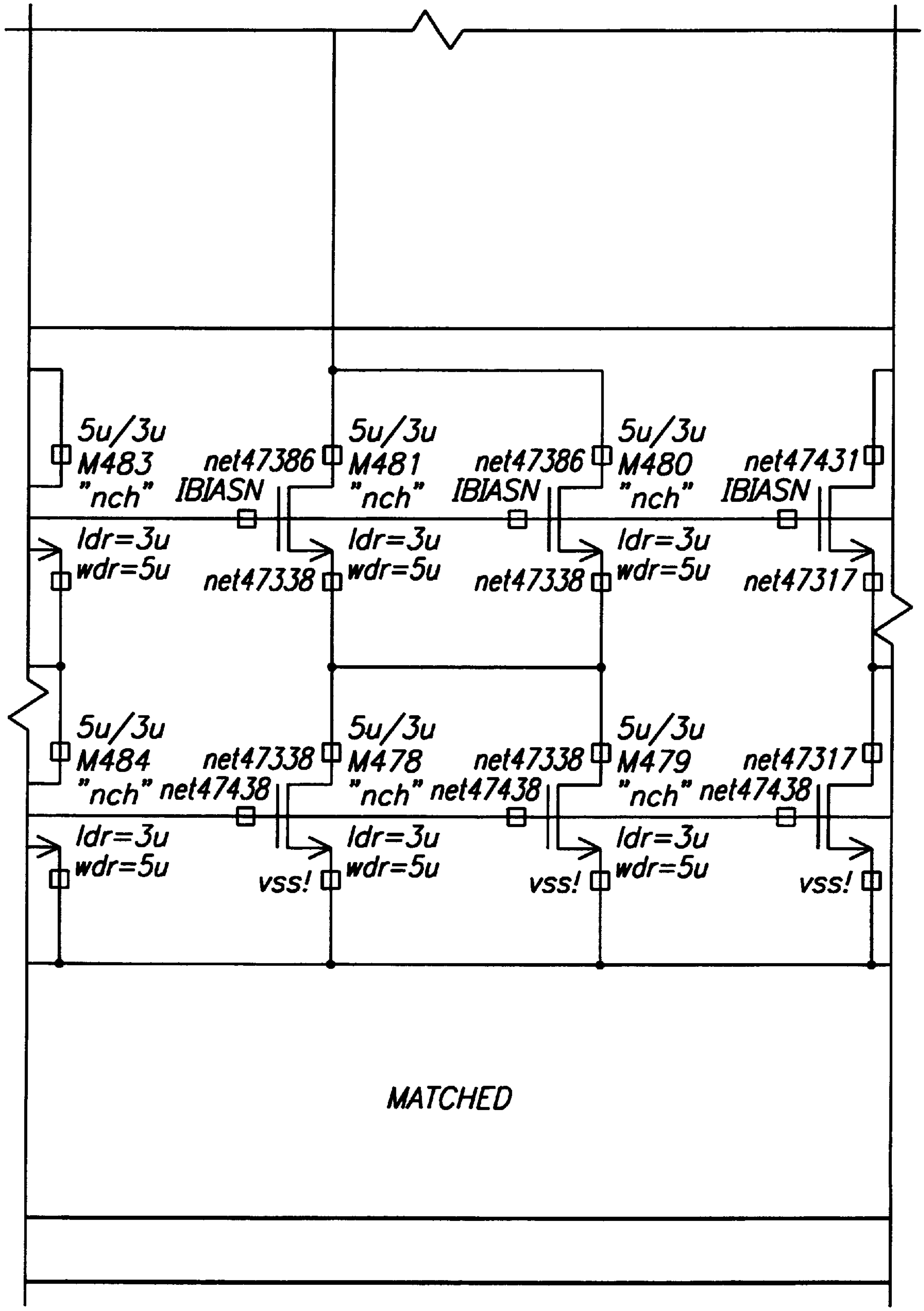
FIG. 16.01DB

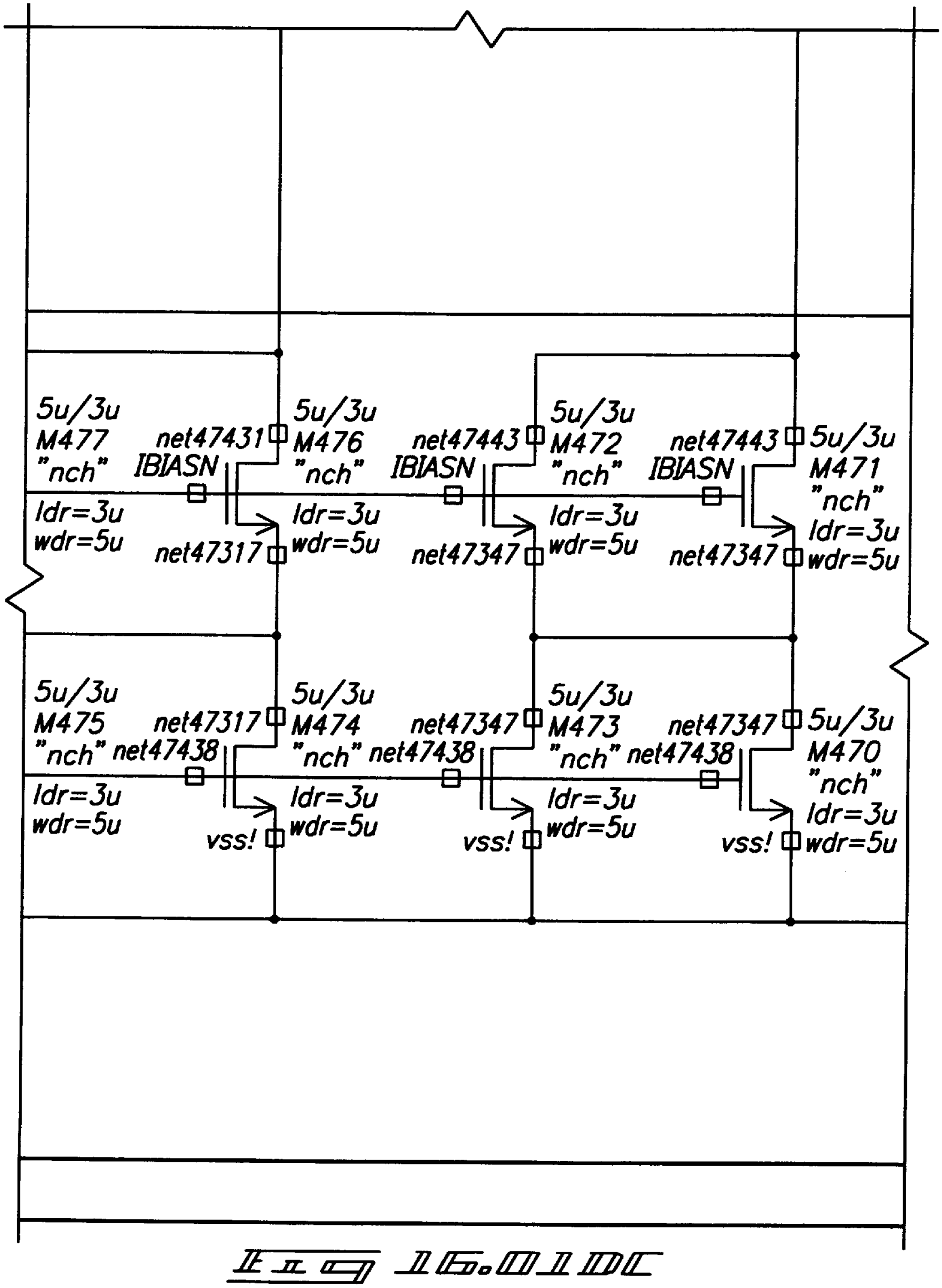
Fig 16.01DC

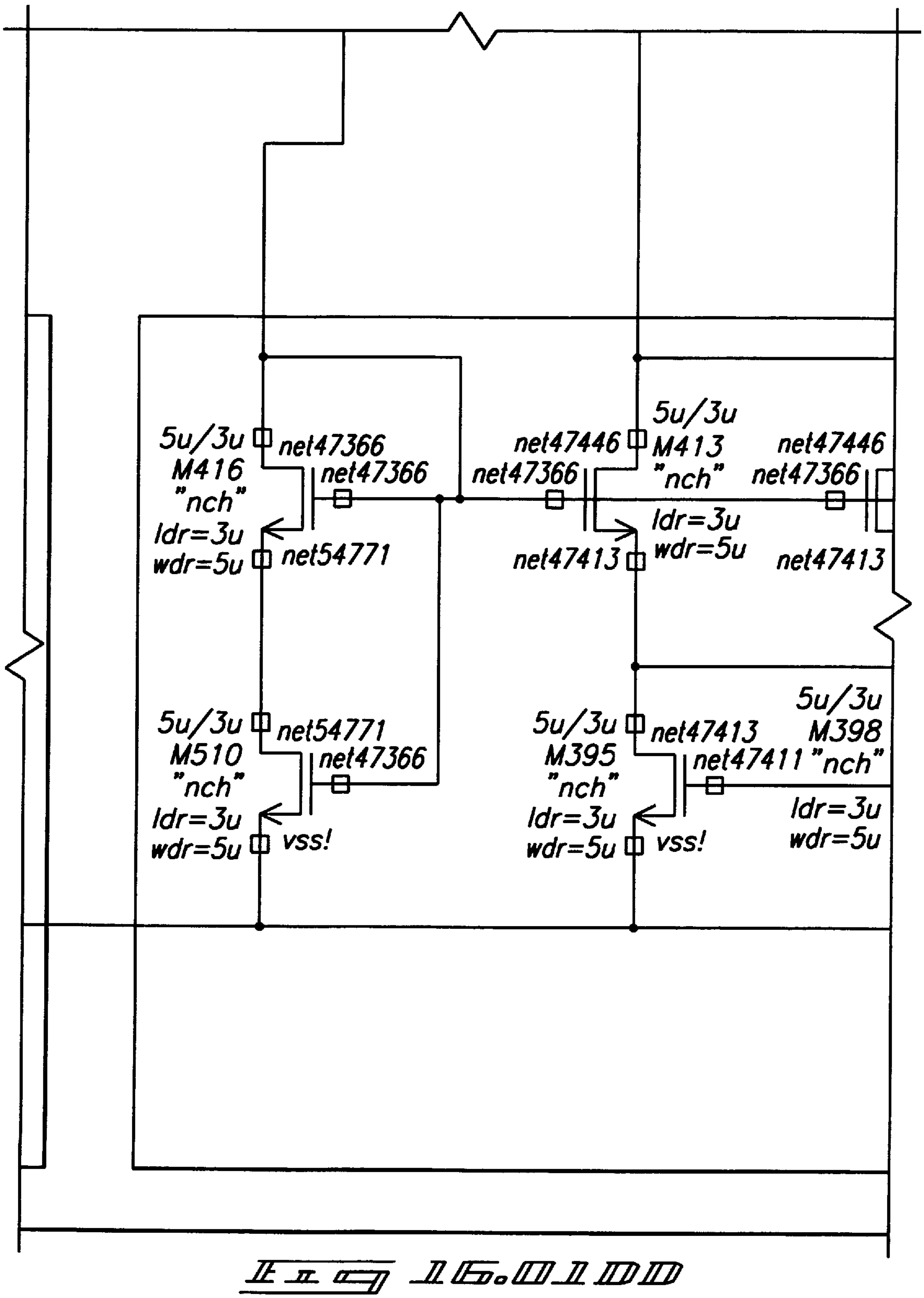
Fig 16.01DD

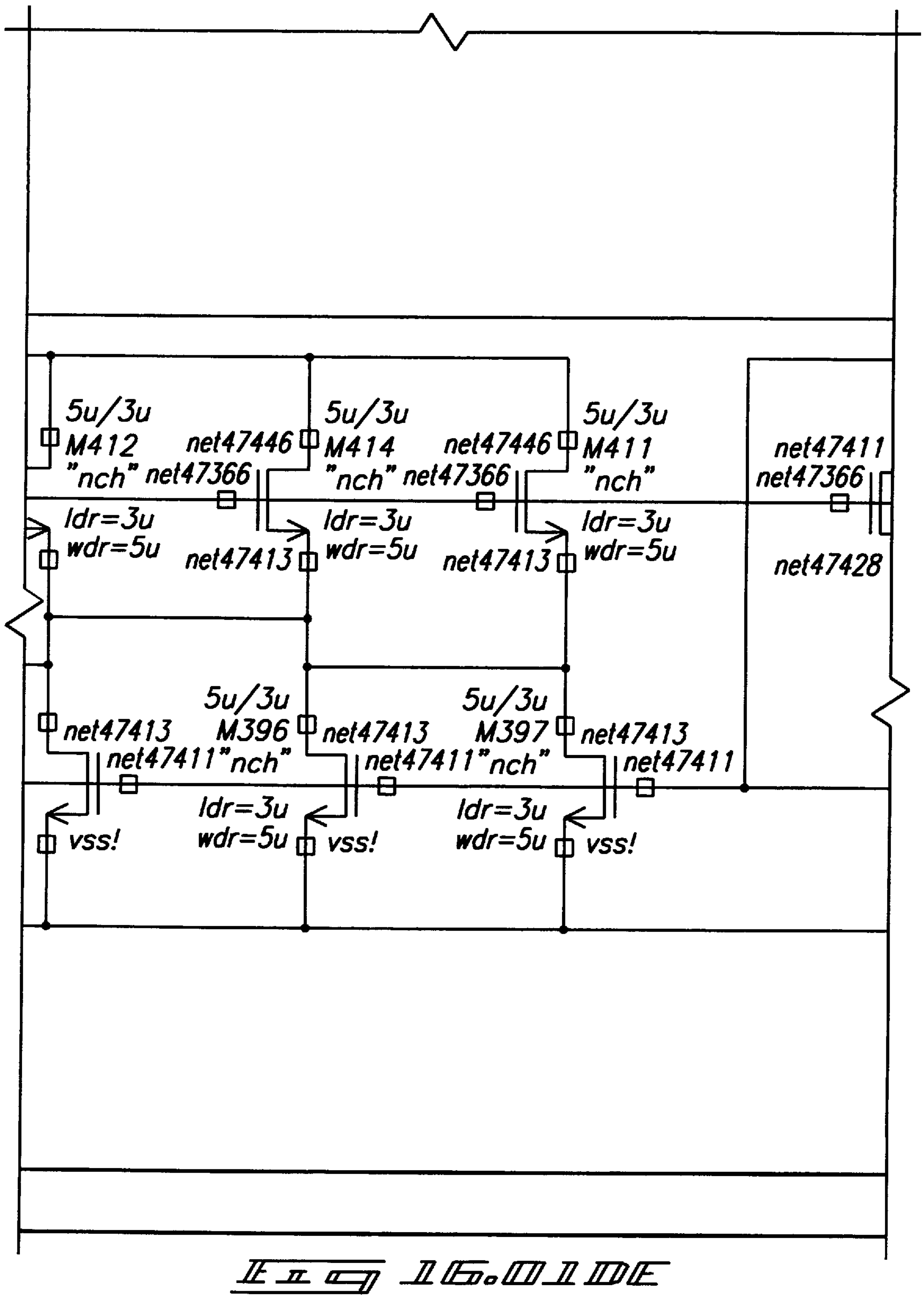
Fig 16.01DE

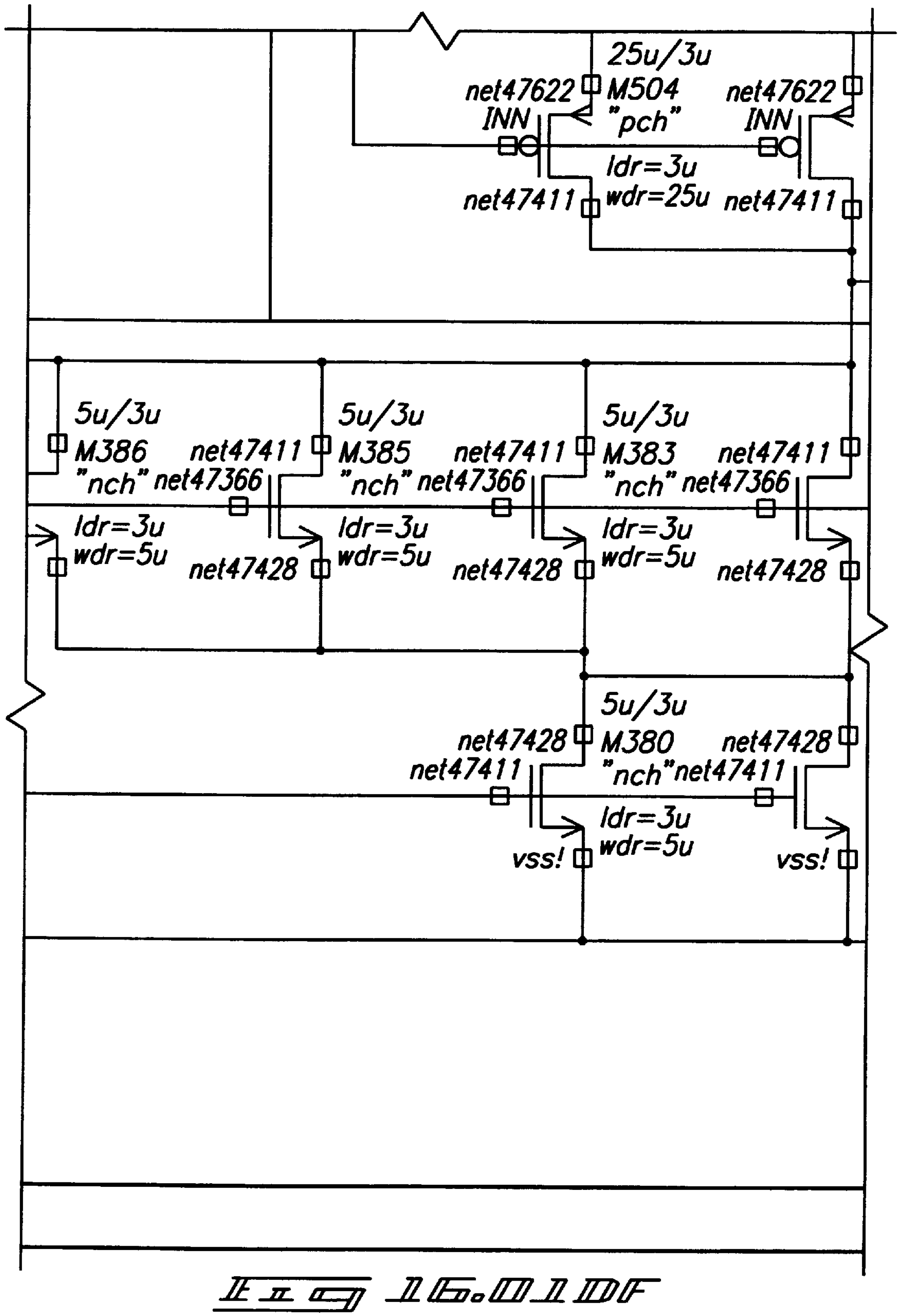
Fig 16.01DF

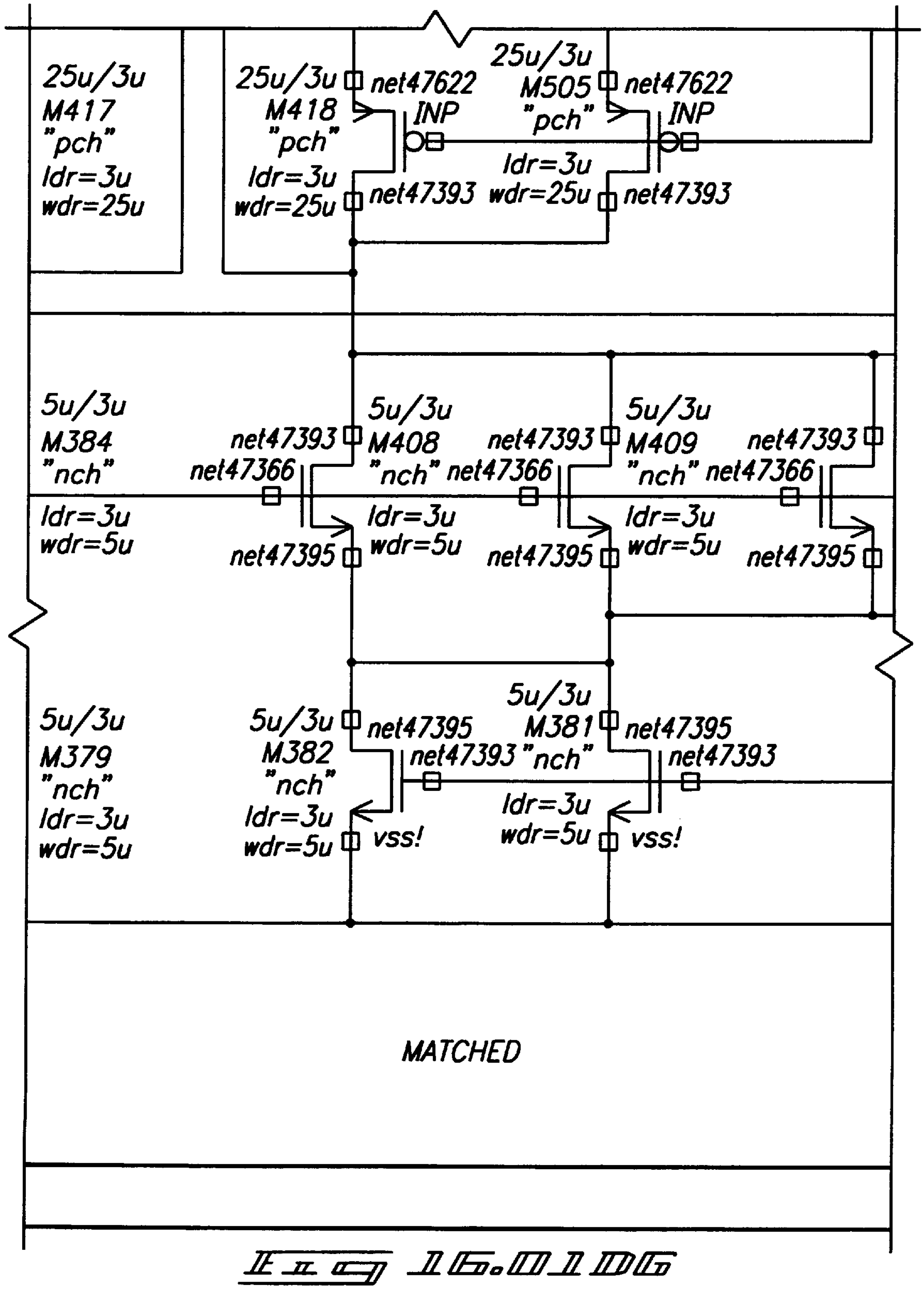
Fig 16.MMIDG

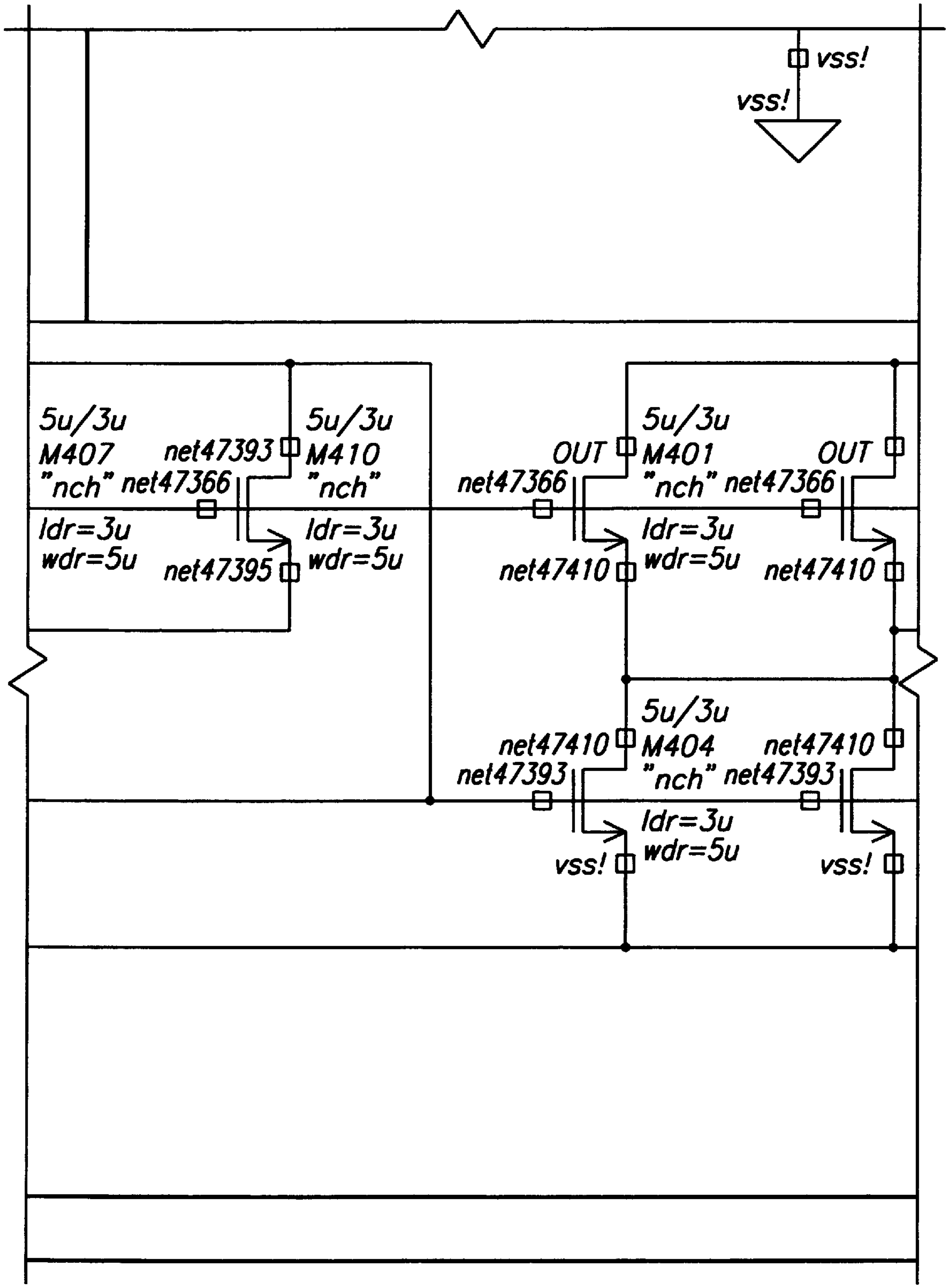
Fig 16.01DH

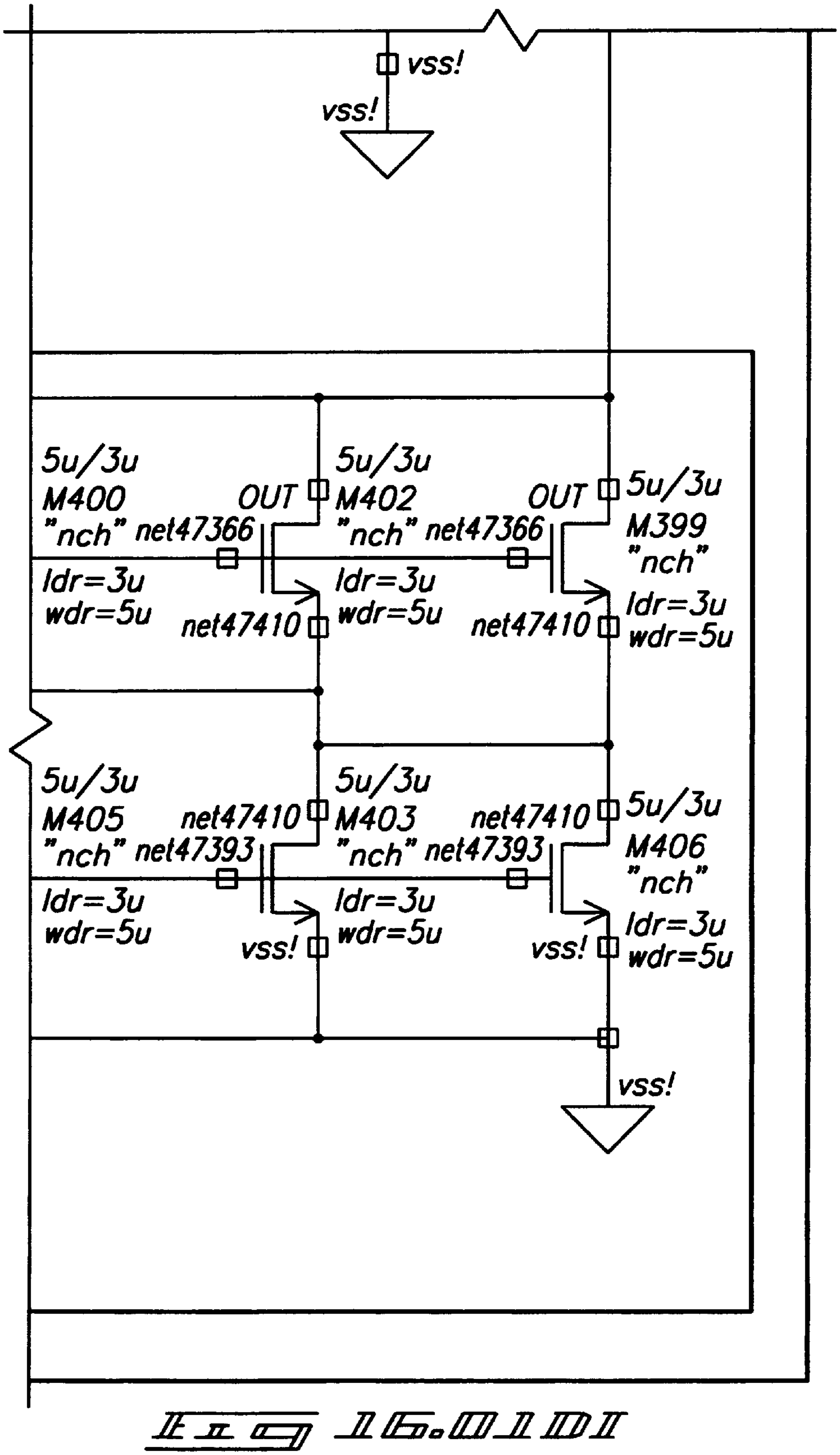
Fig 16.001DI

| | | | | | | | | | | |
|---|---|---|---|---|---|---|---|---|---|---|
| 19AA | 19AB | 19AC | 19AD | 19AE | 19AF | 19AG | 19AH | 19AI | 19AJ | 19AK |
| 19BA | 19BB | 19BC | 19BD | 19BE | 19BF | 19BG | 19BH | 19BI | 19BJ | 19BK |
| 19CA | 19CB | 19CC | 19CD | 19CE | 19CF | 19CG | 19CH | 19CI | 19CJ | 19CK |
| 19DA | 19DB | 19DC | 19DD | 19DE | 19DF | 19DG | 19DH | 19DI | 19DJ | 19DK |
| 19EA | 19EB | 19EC | 19ED | 19EE | 19EF | 19EG | 19EH | 19EI | 19EJ | 19EK |

Fig 19

| | | | | | | | | | |
|---|---|---|---|---|---|---|---|---|---|
| 20AA | 20AB | | | | | | | | |
| 20BA | 20BB | 20BC | 20BD | 20BE | 20BF | 20BG | 20BH | 20BI | 20BJ |
| 20CA | 20CB | 20CC | 20CD | 20CE | 20CF | 20CG | 20CH | 20CI | 20CJ |
| 20DA | 20DB | 20DC | 20DD | 20DE | 20DF | 20DG | 20DH | 20DI | 20DJ |
| 20EA | 20EB | 20EC | 20ED | 20EE | 20EF | 20EG | 20EH | 20EI | 20EJ |
| 20FA | 20FB | 20FC | 20FD | 20FE | 20FF | 20FG | 20FH | 20FI | 20FJ |
| | | | 20GD | 20GE | 20GF | 20GG | 20GH | 20GI | 20GJ |
| | | | 20HD | 20HE | 20HF | 20HG | 20HH | 20HI | 20HJ |

Fig. 20

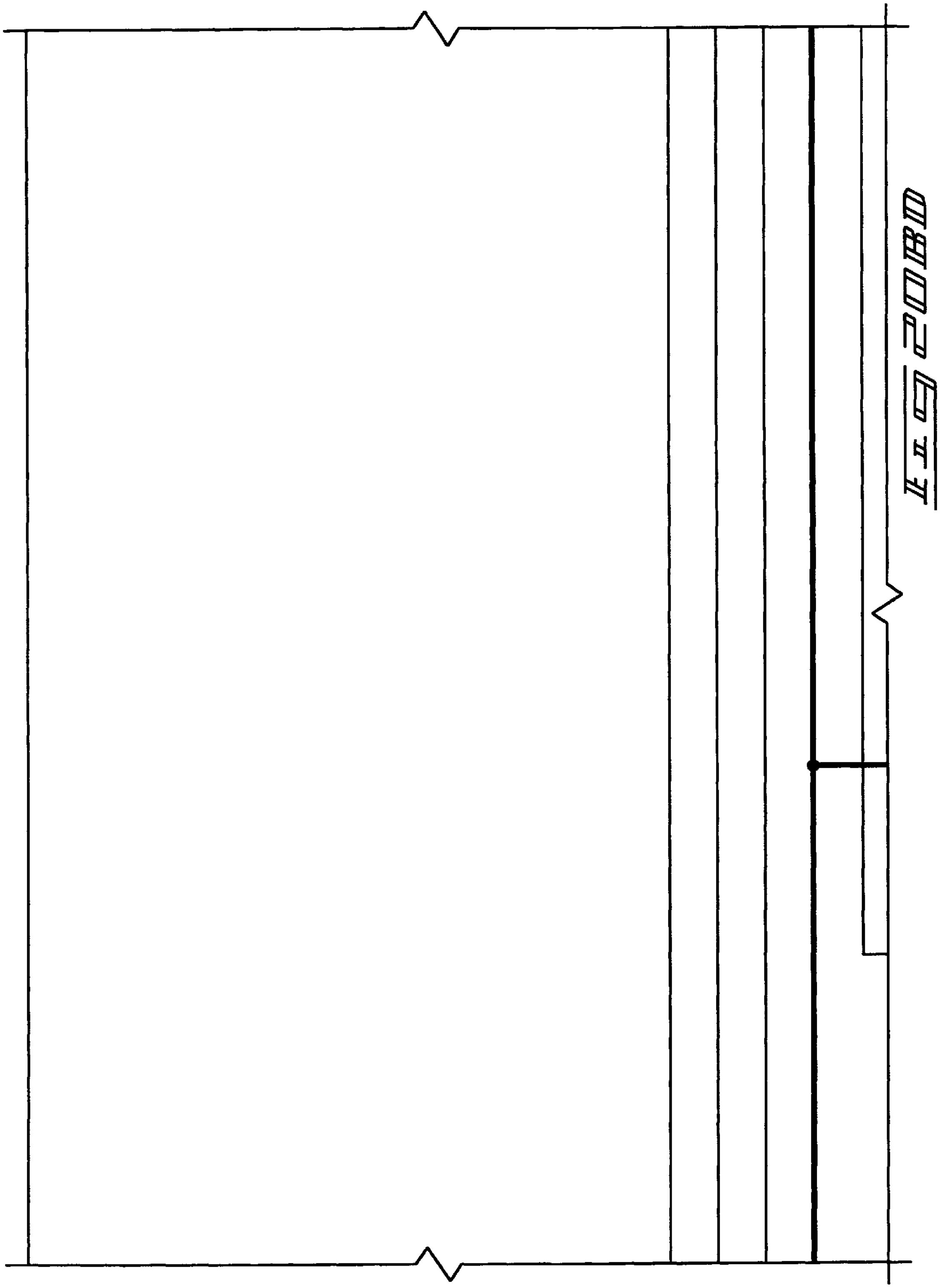
FIG. 2080

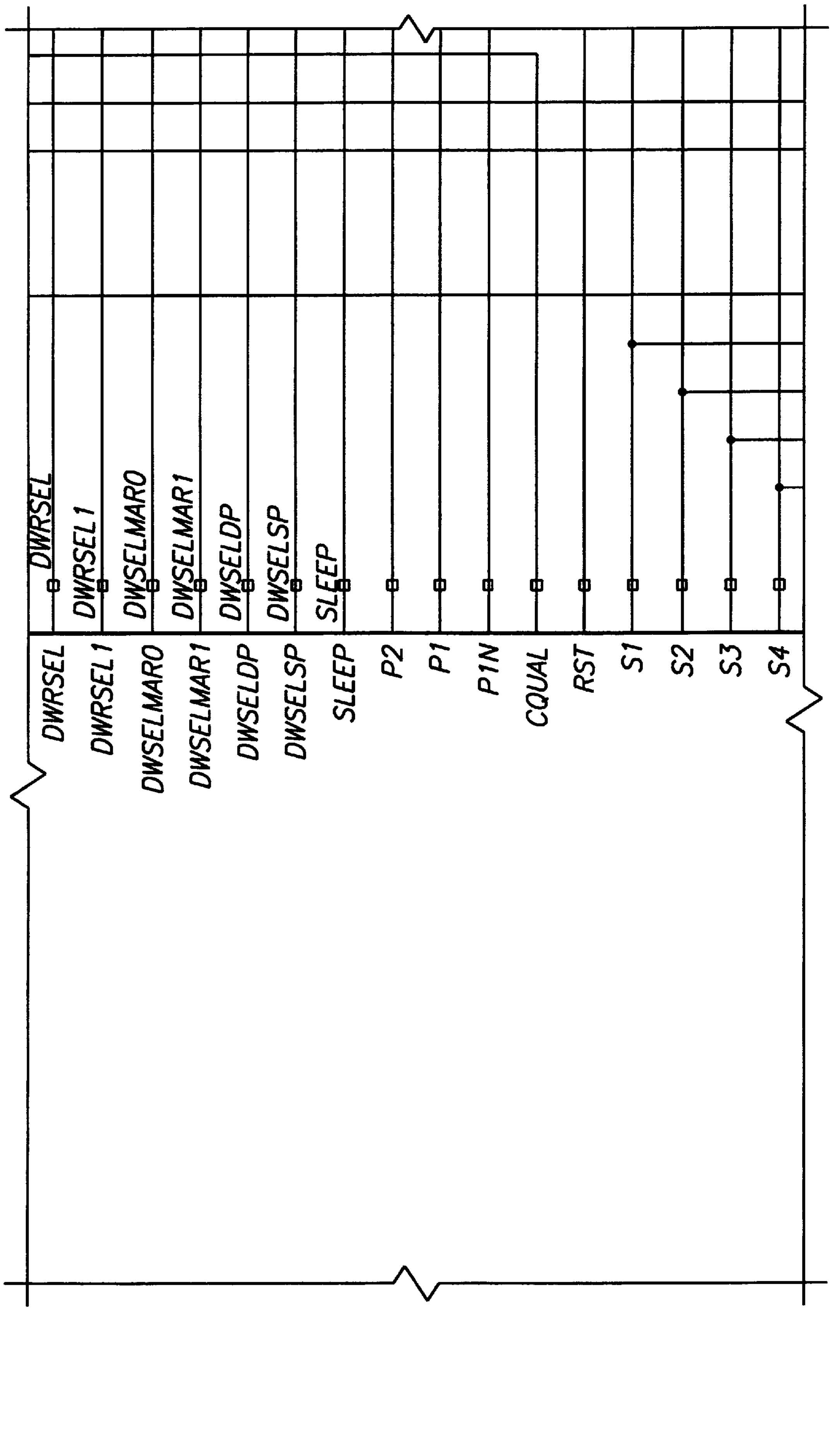
Fig 20EIII

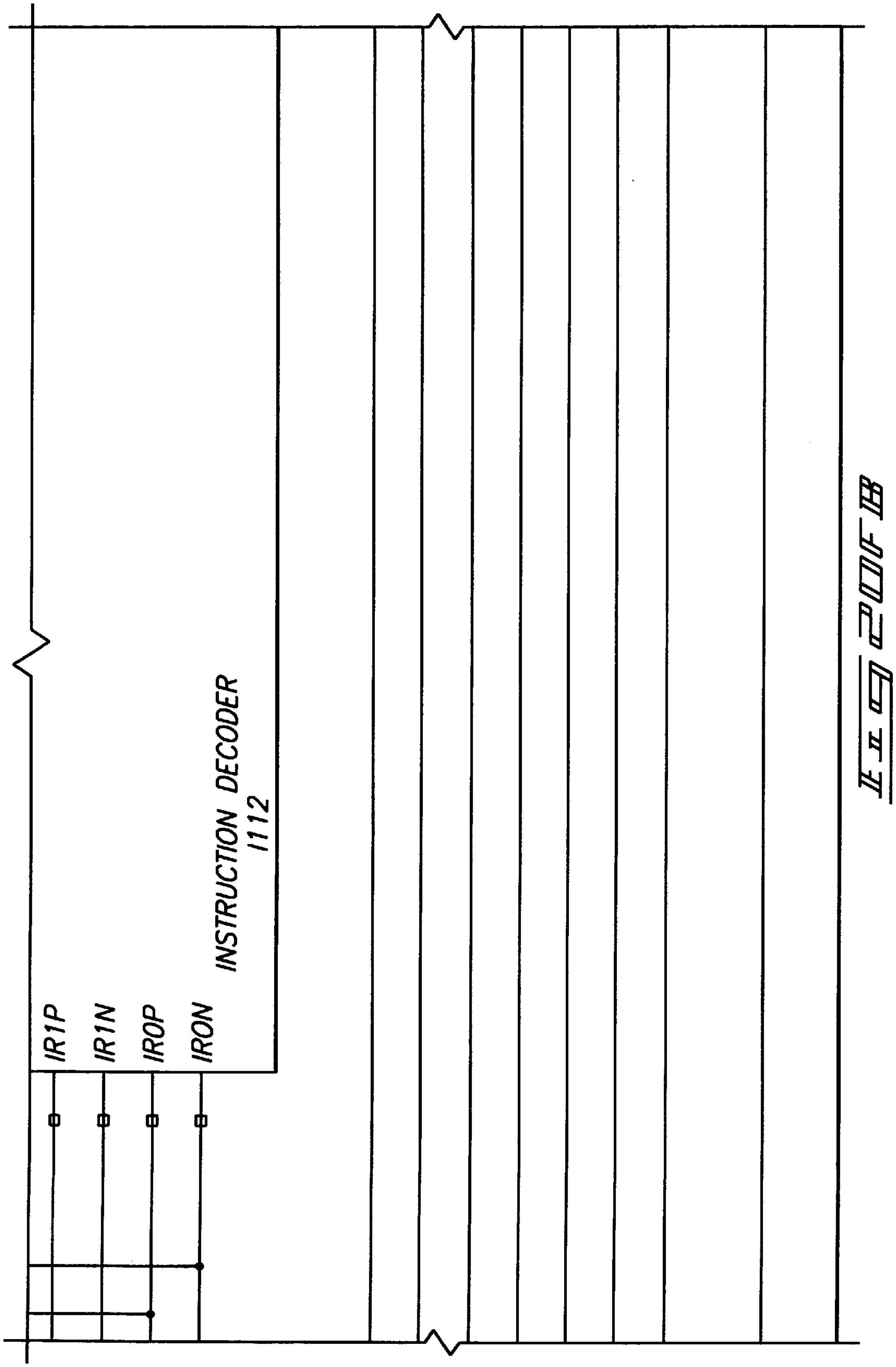
FIG. 20F18

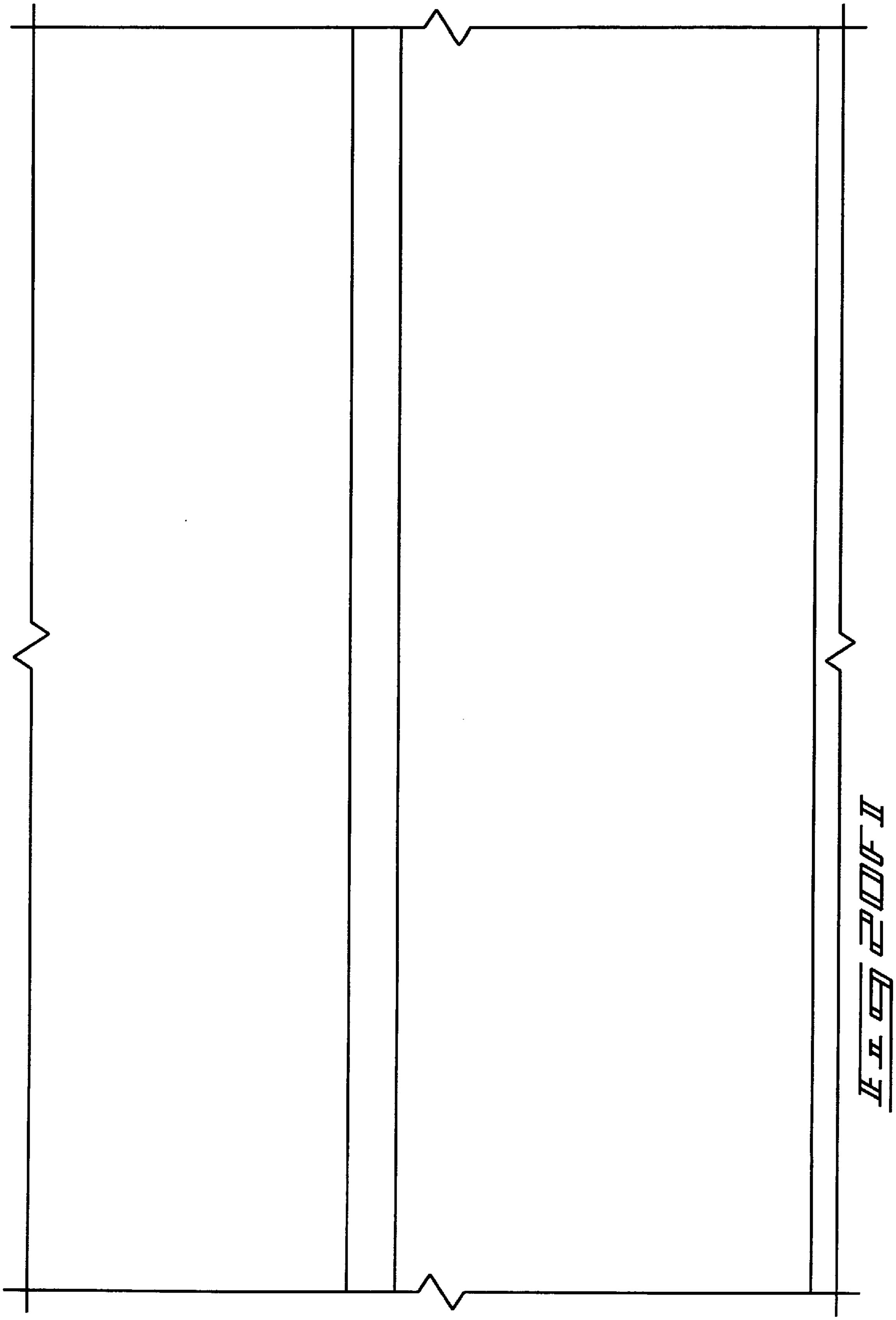
Fig. 20F I

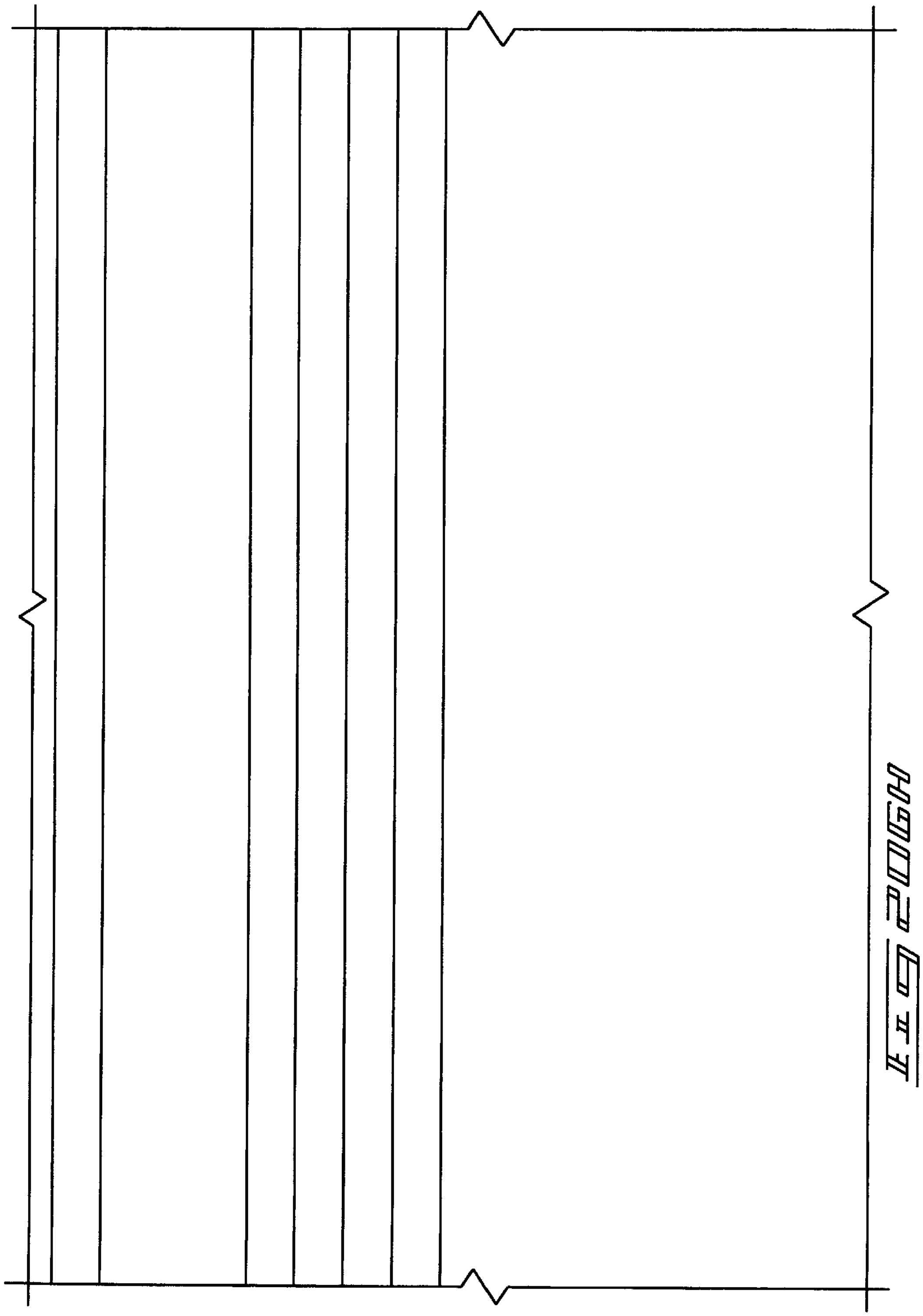
Fig. 2064

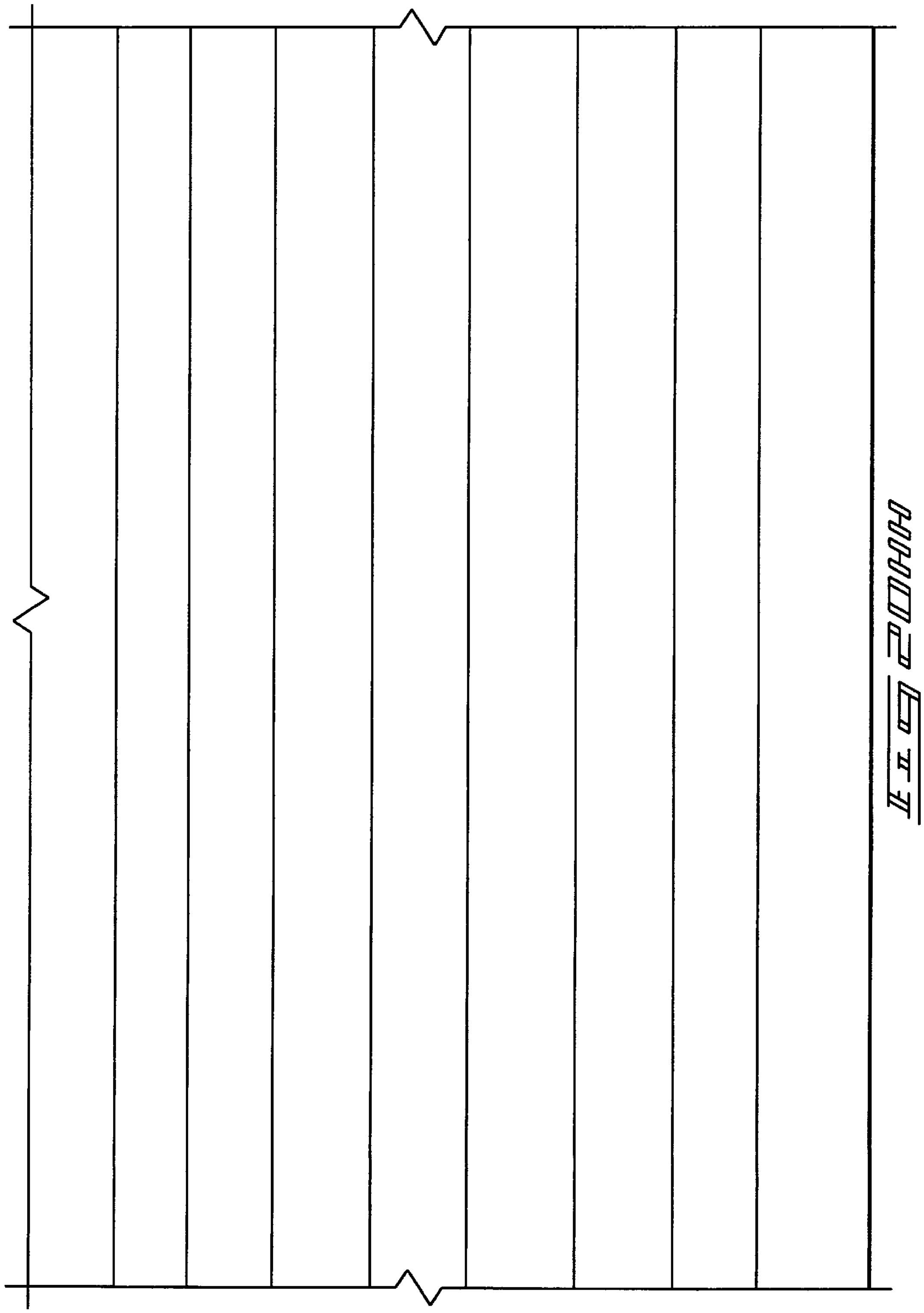
FIG. 2044

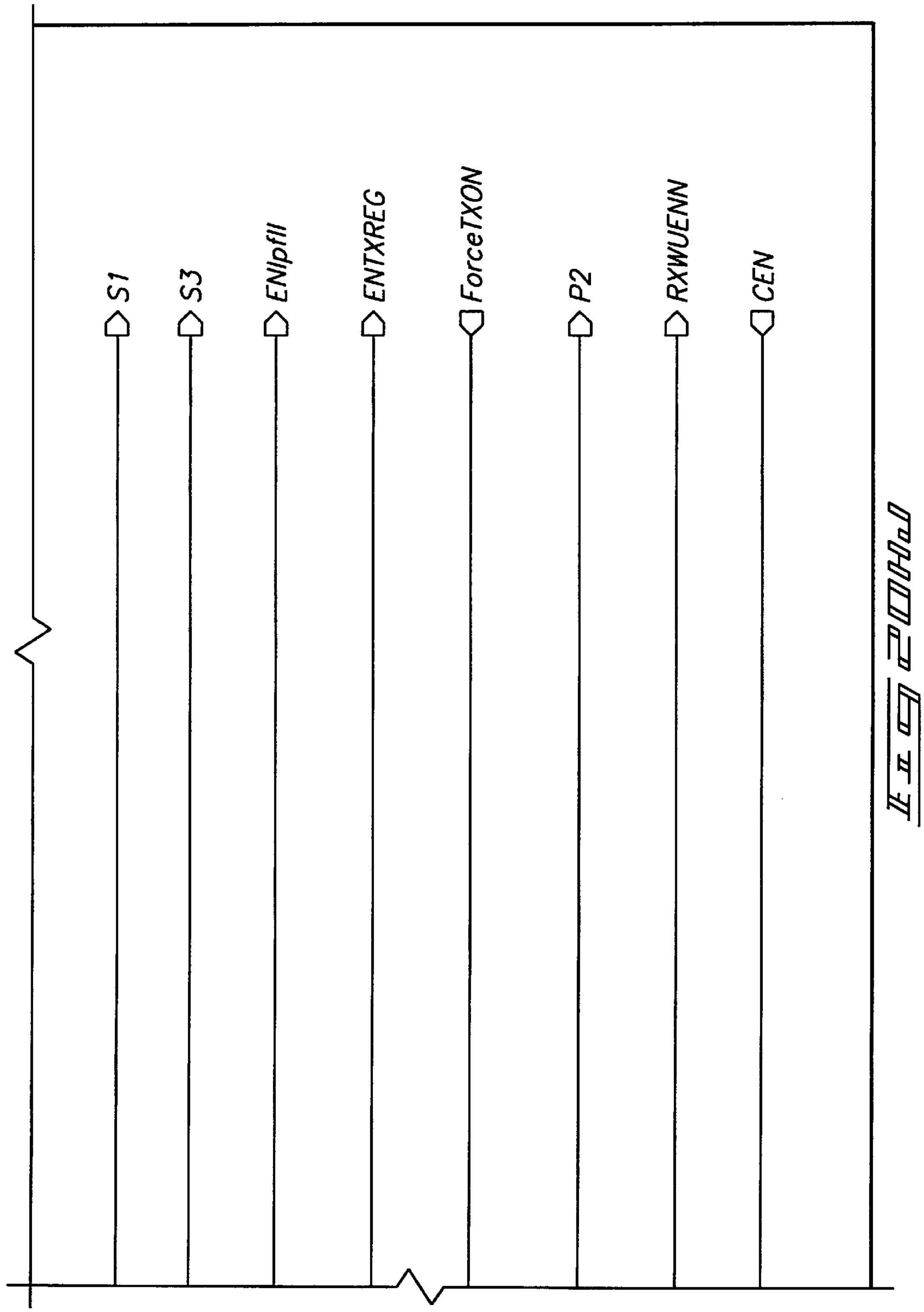
S1
S3
ENIpfll
ENTXREG
ForceTXON
P2
RXWUENN
CEN

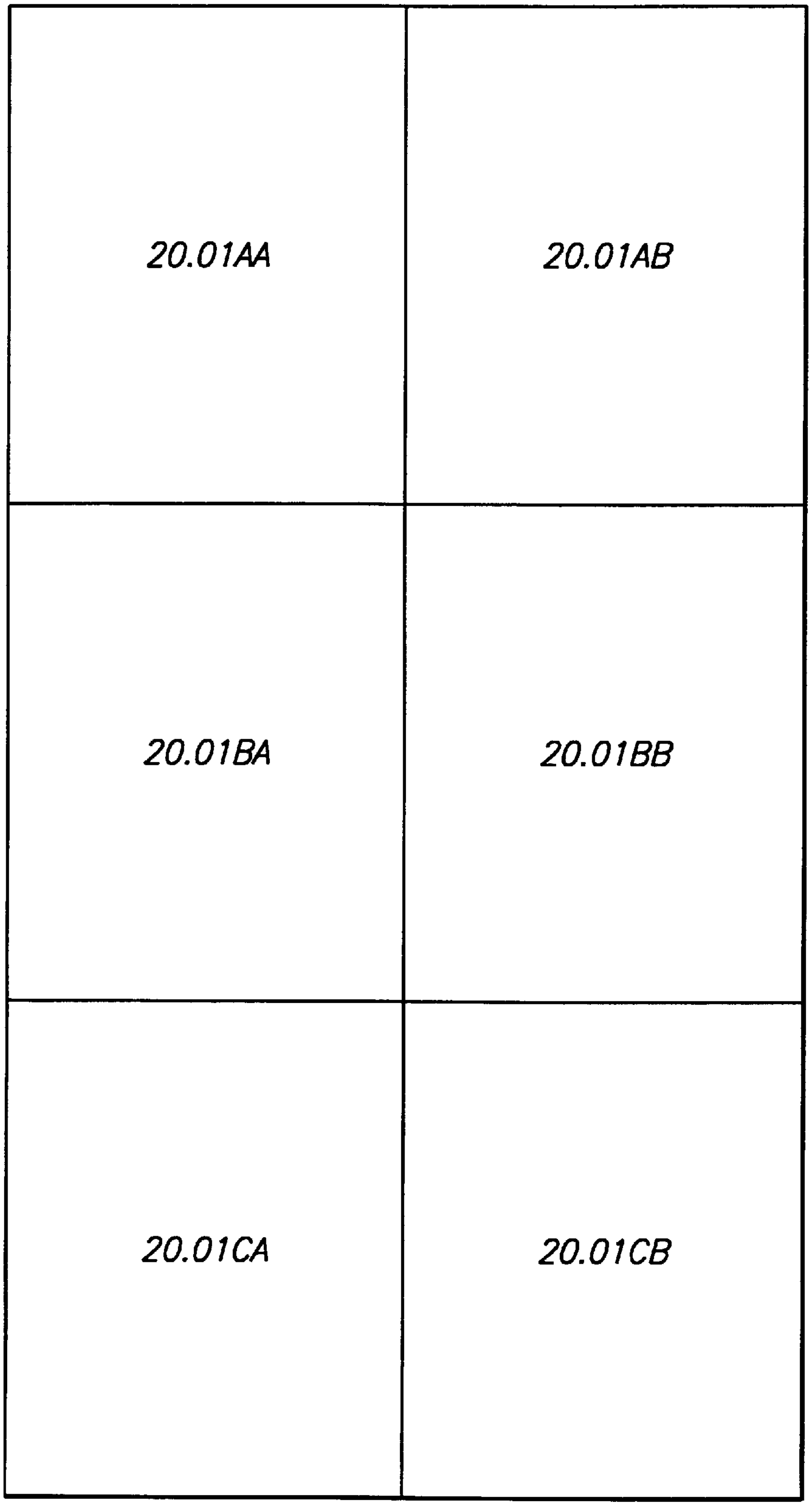
Fig 20.01

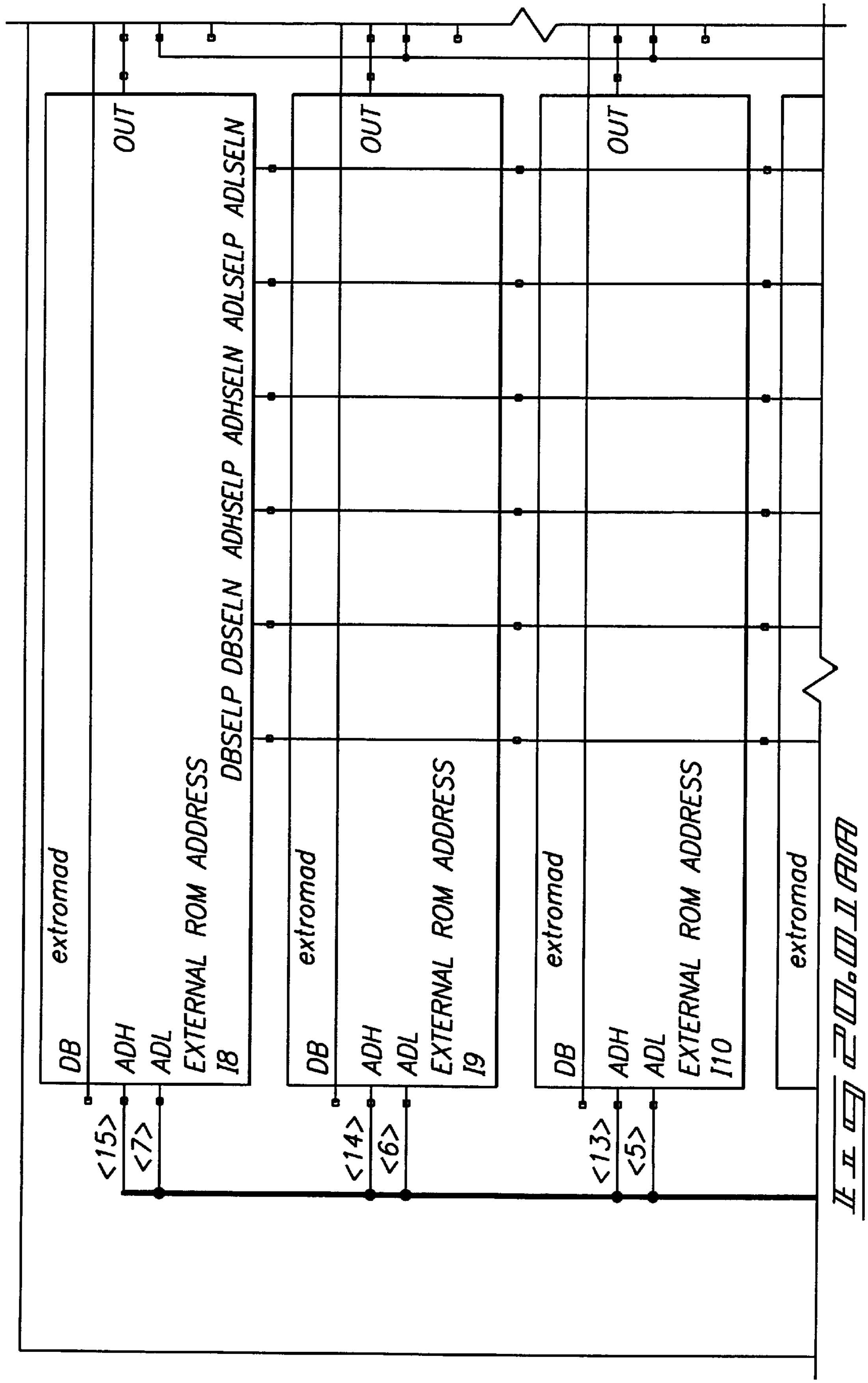
FIG. 20.01AA

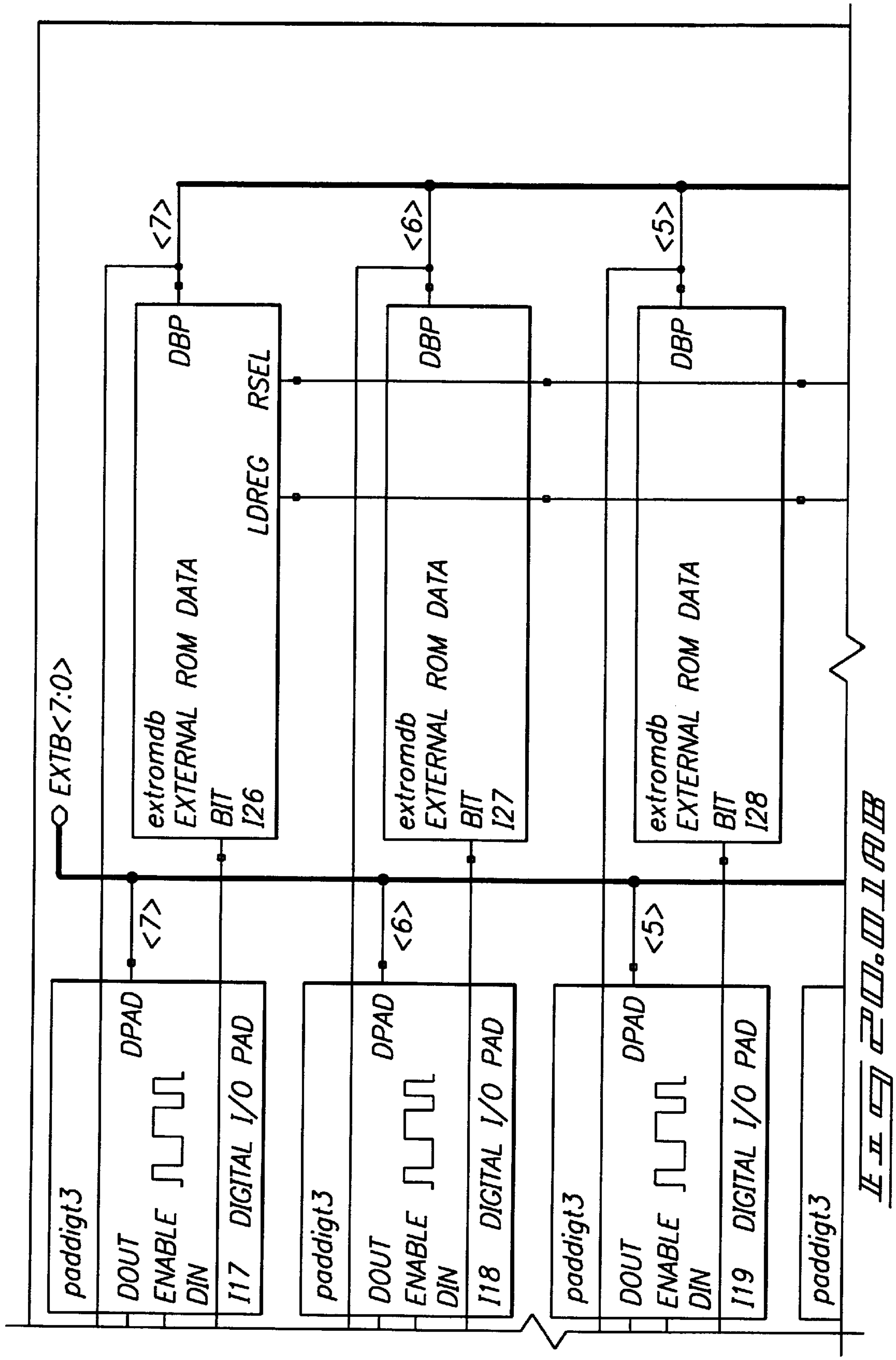
FIG. 20.01AB

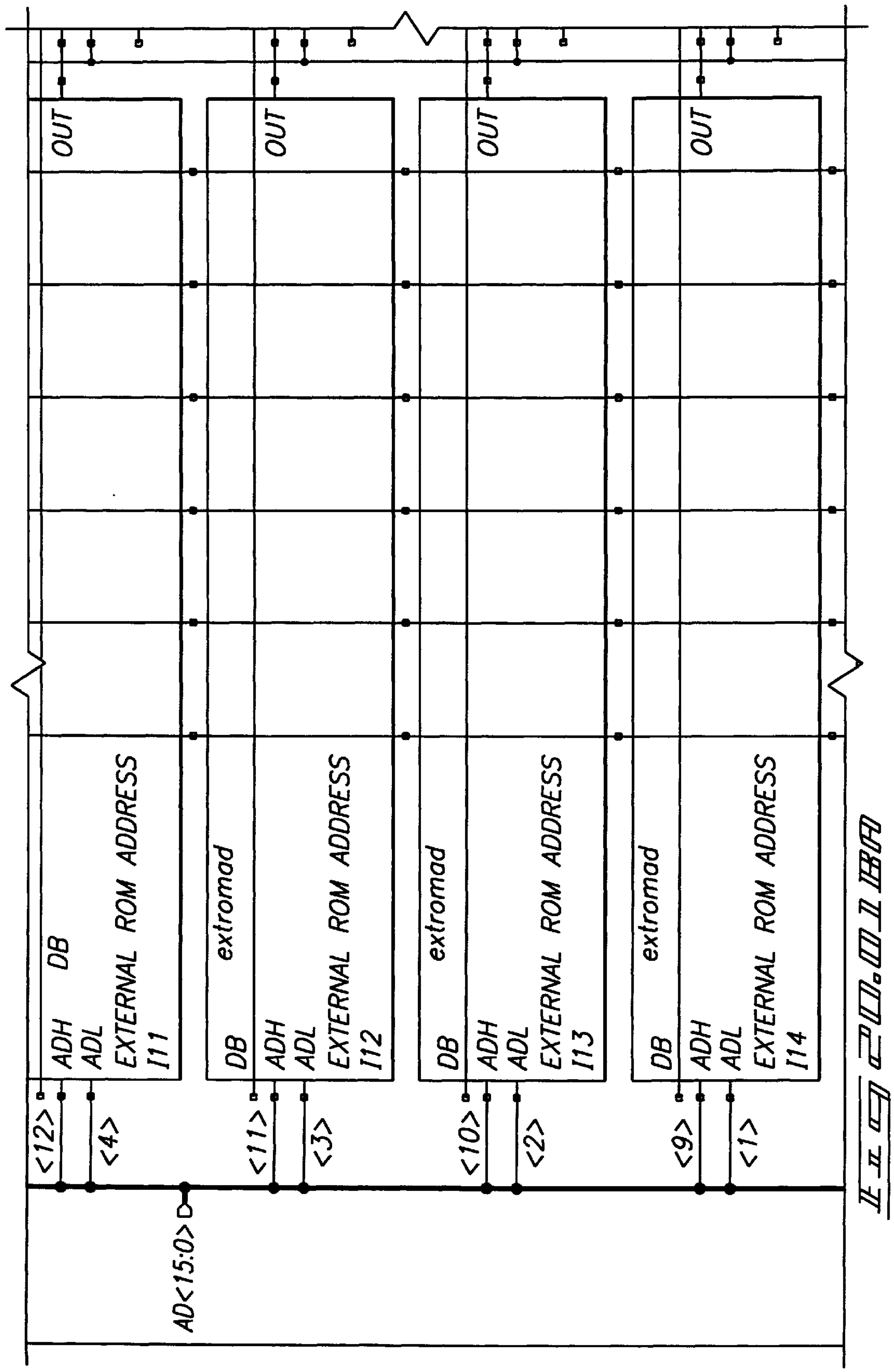
Fig. 20.01BA

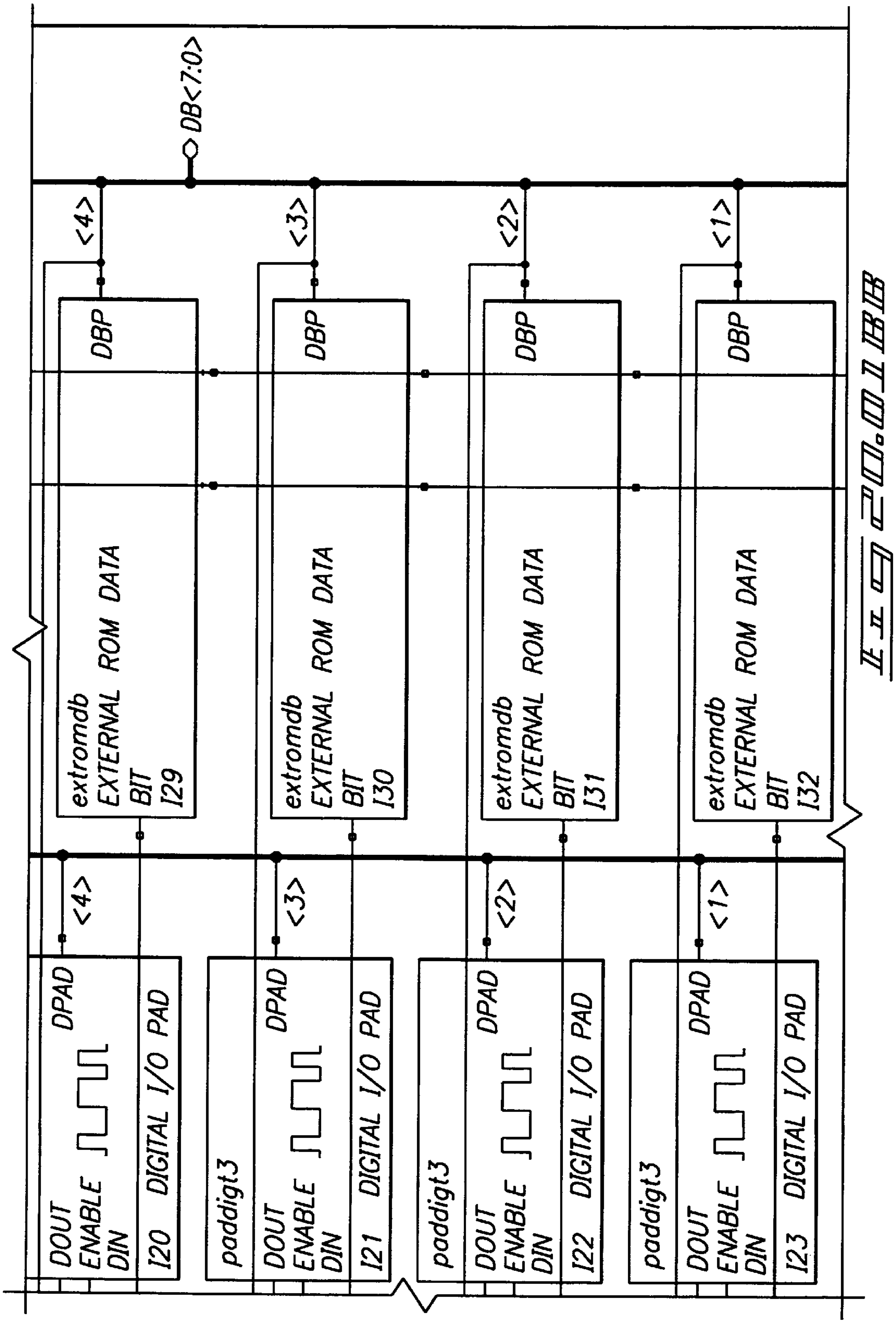
Fig. 20.01BB

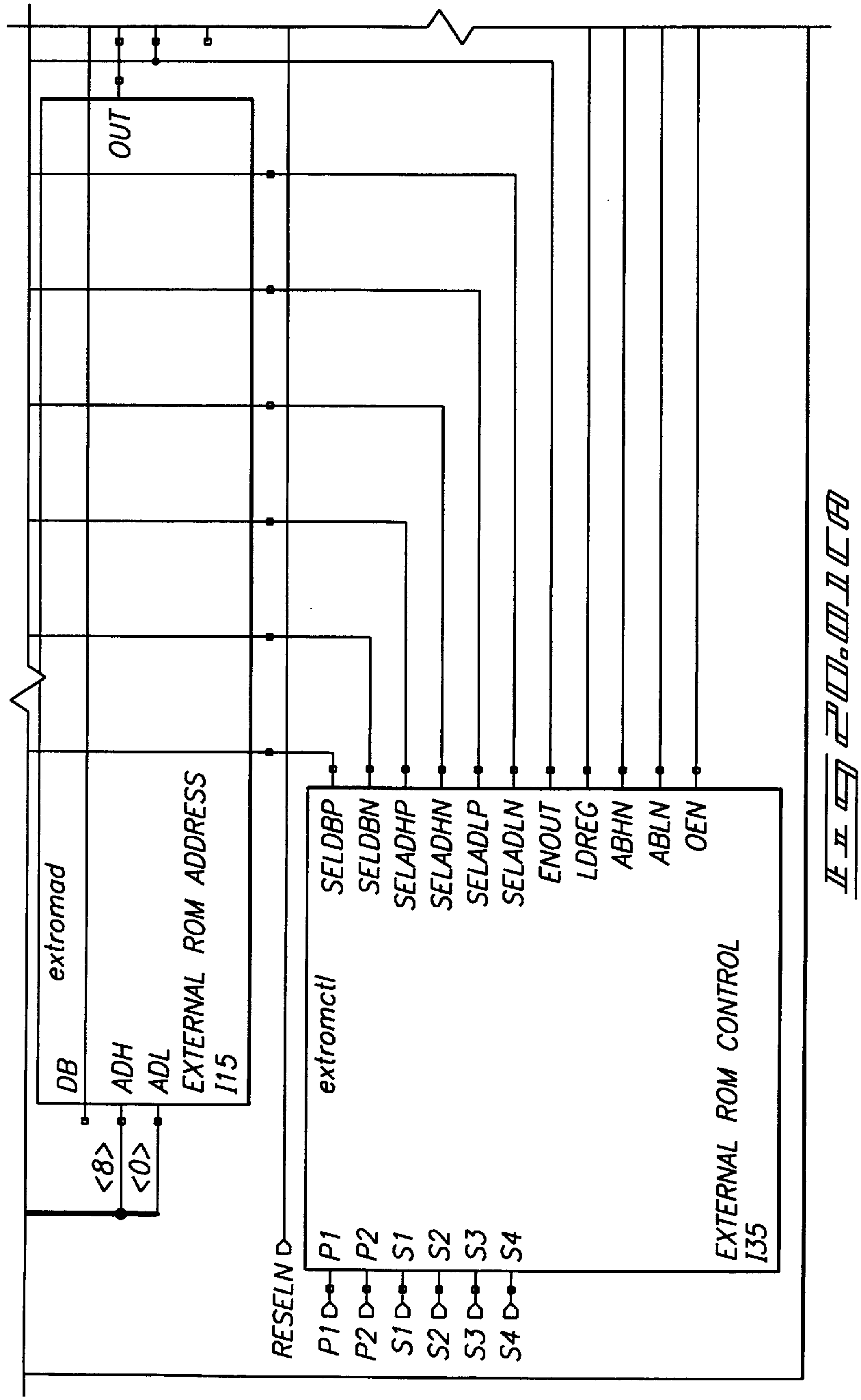
FIG. 20.01CA

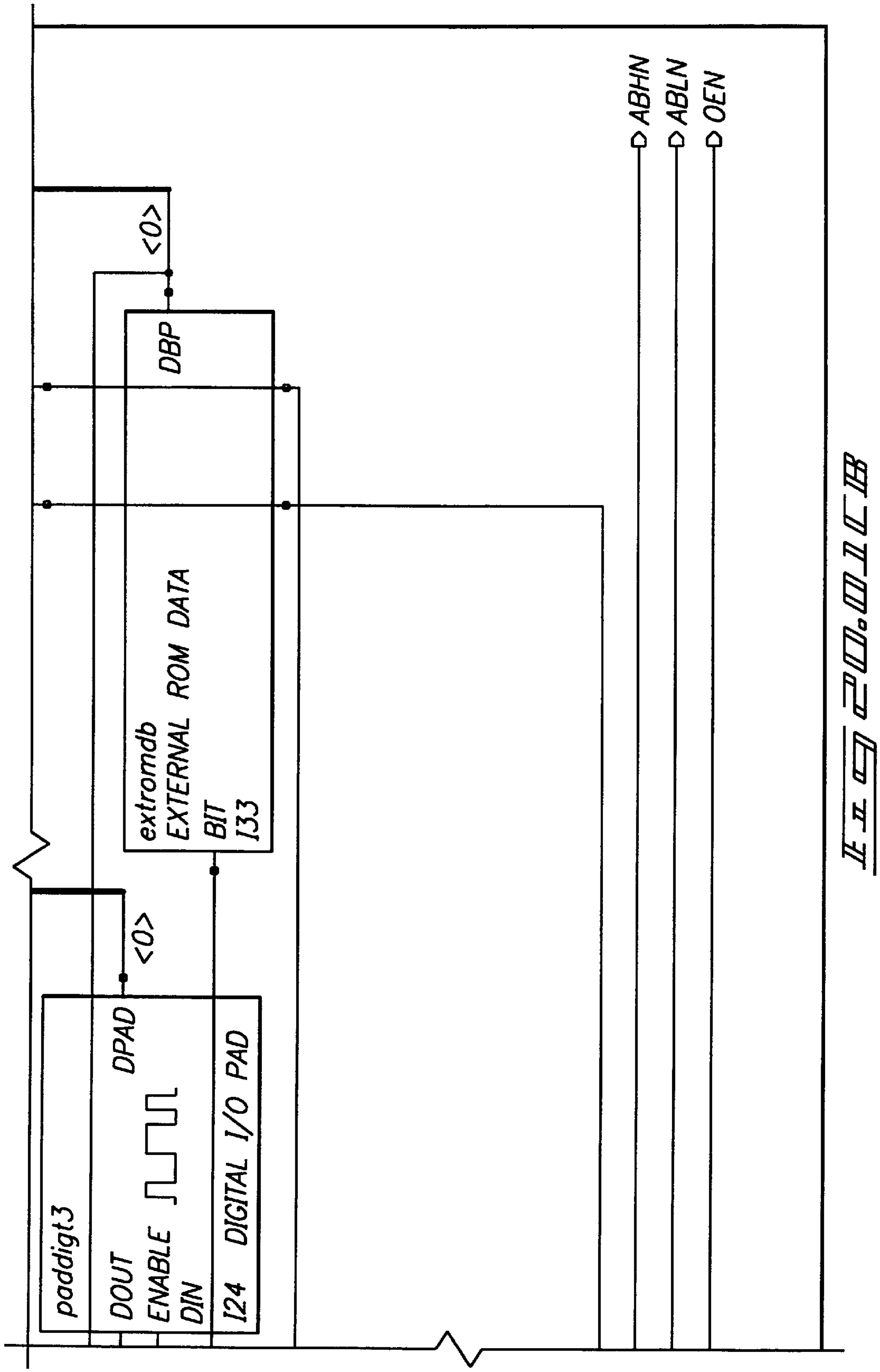
FIG. 20.01CB

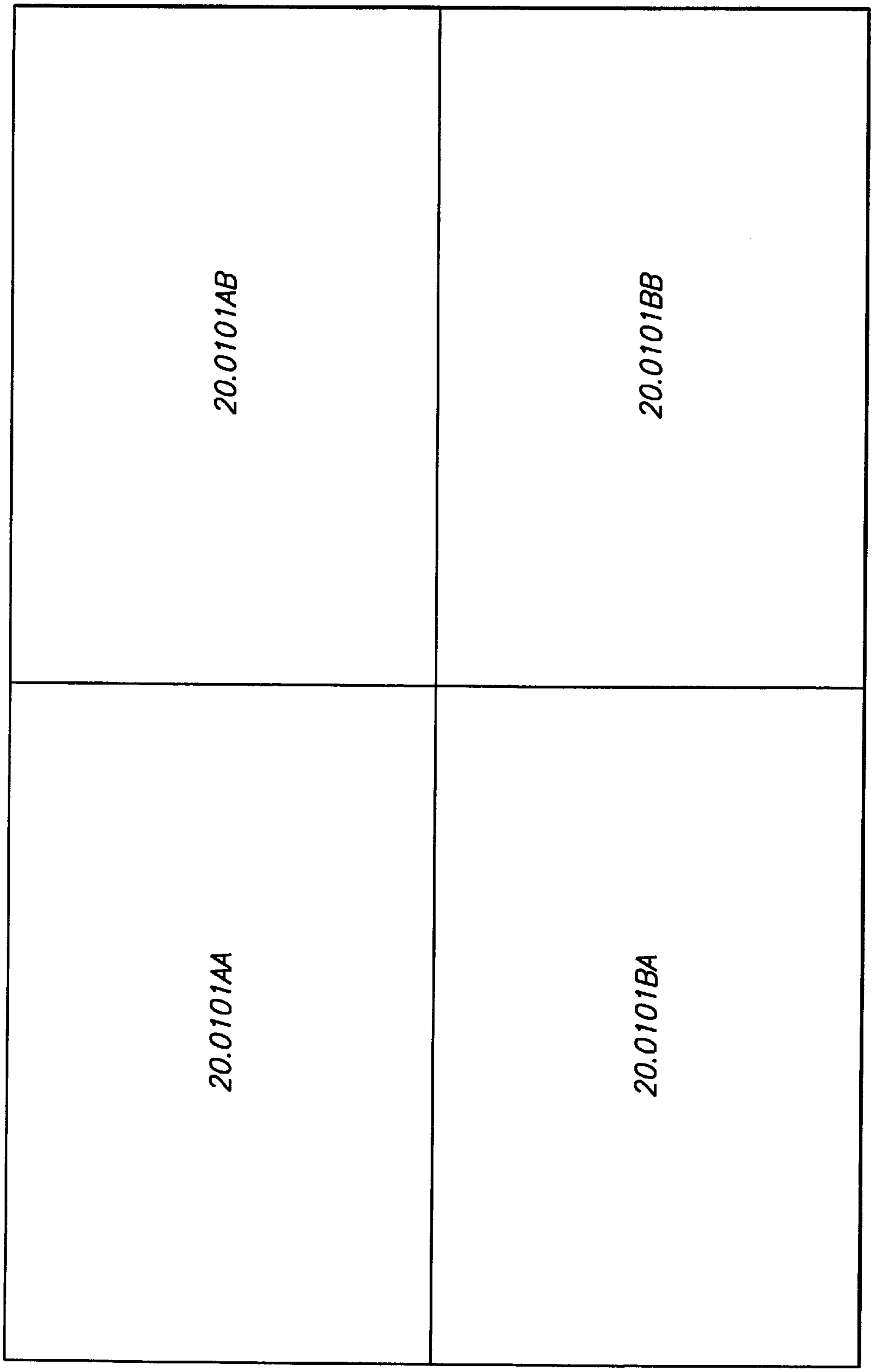
FIG. 20.0101

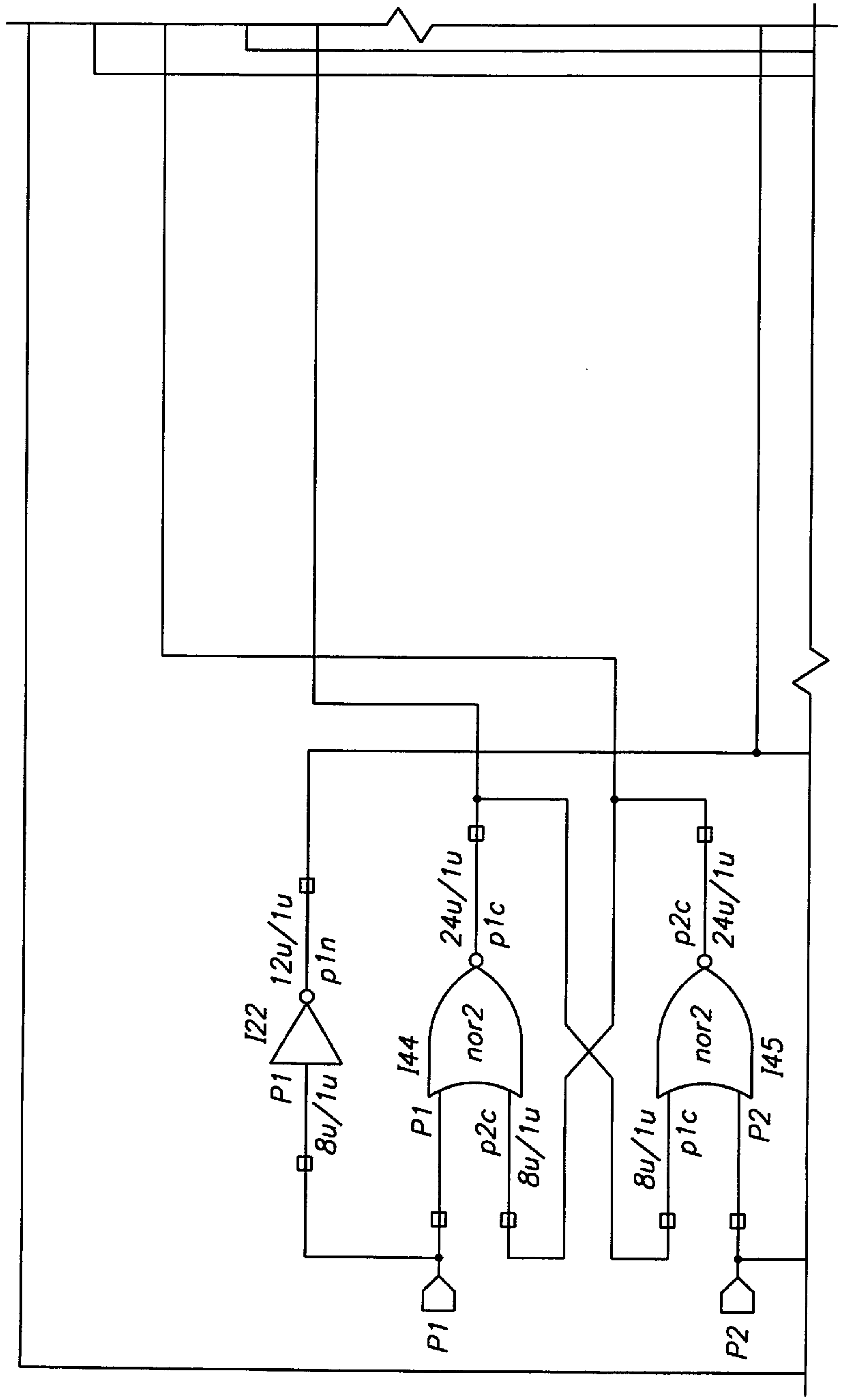
Fig 20.0101AA

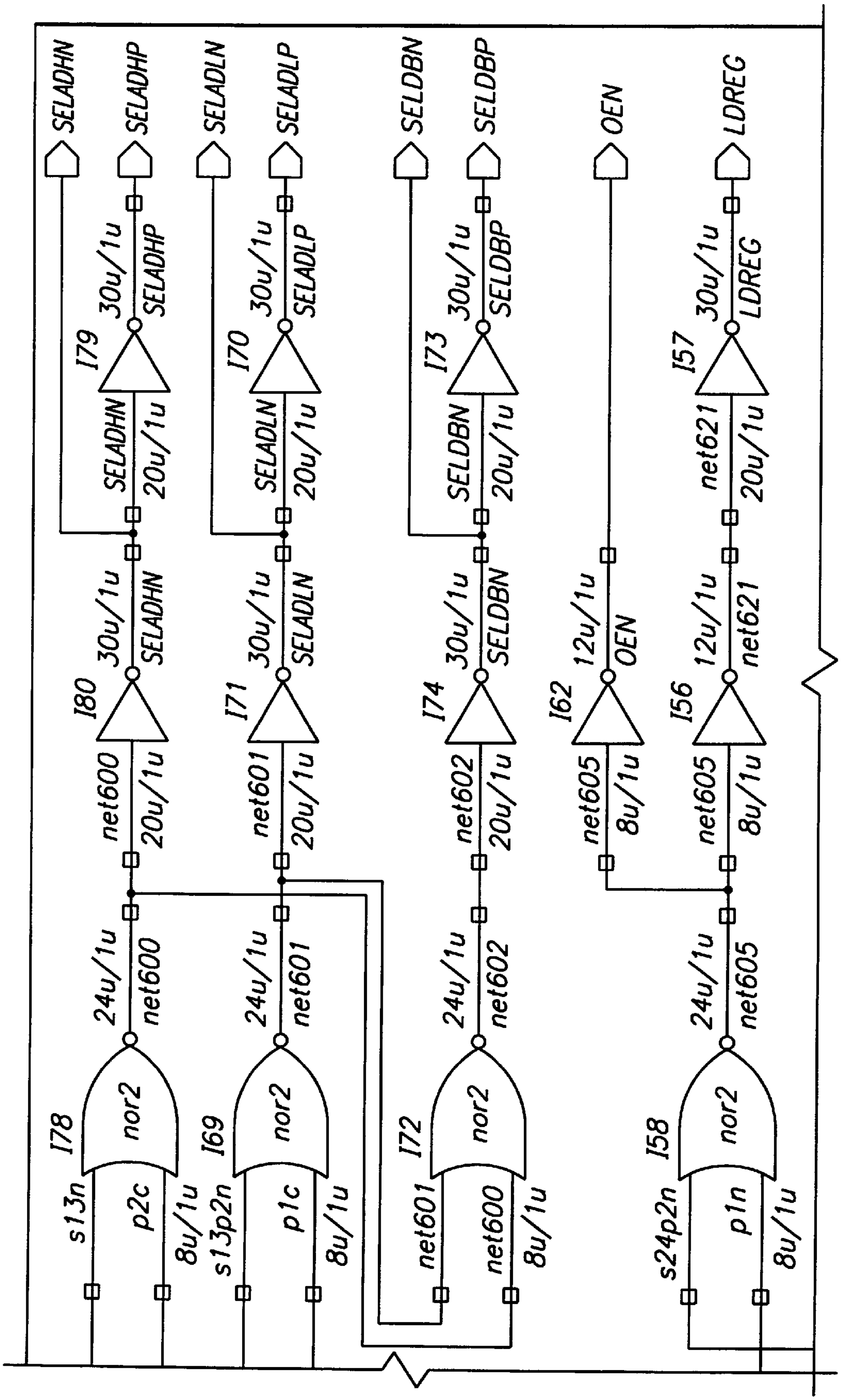
Fig. 20.0101AB

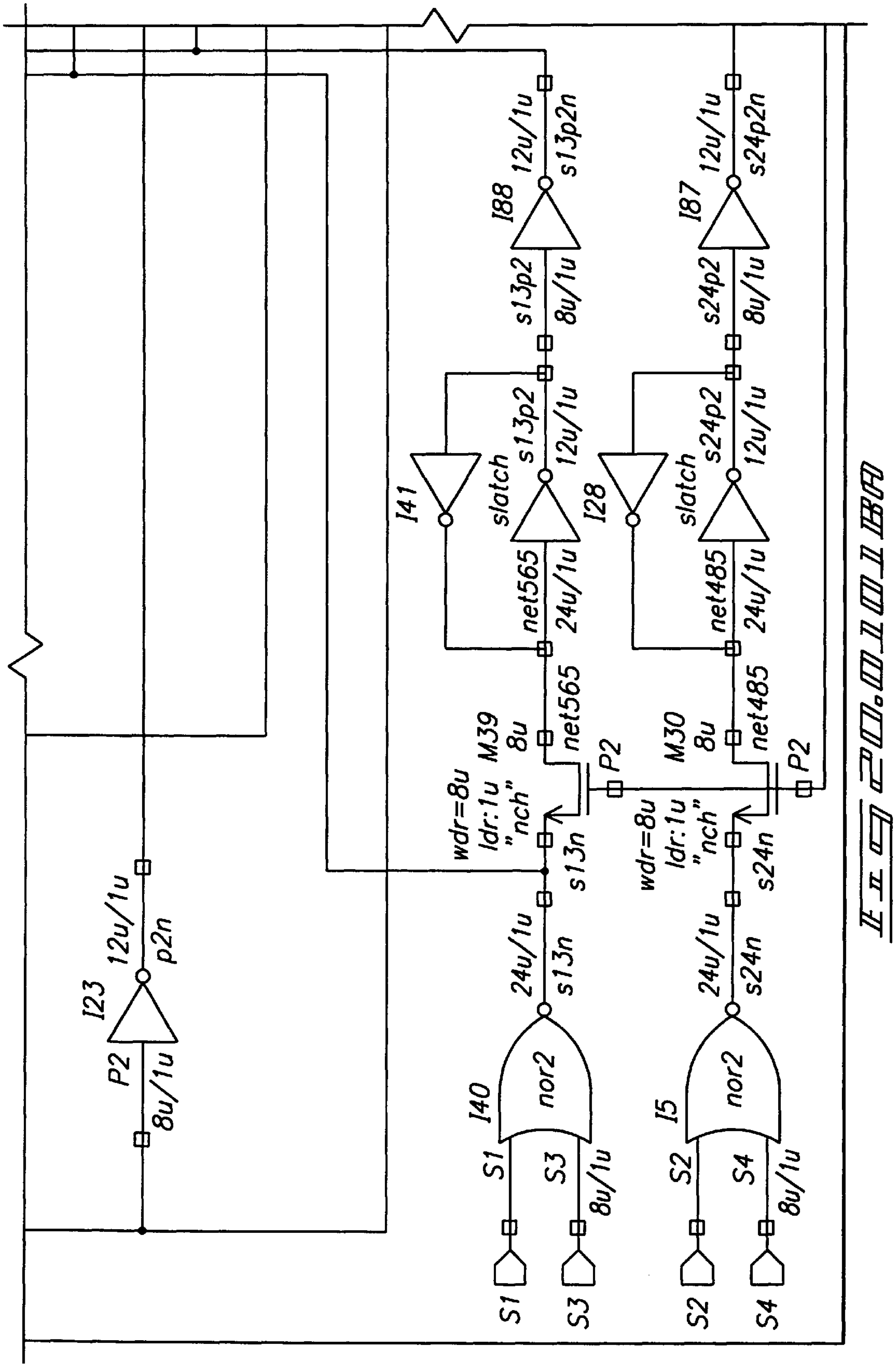
Fig. 20.011BA

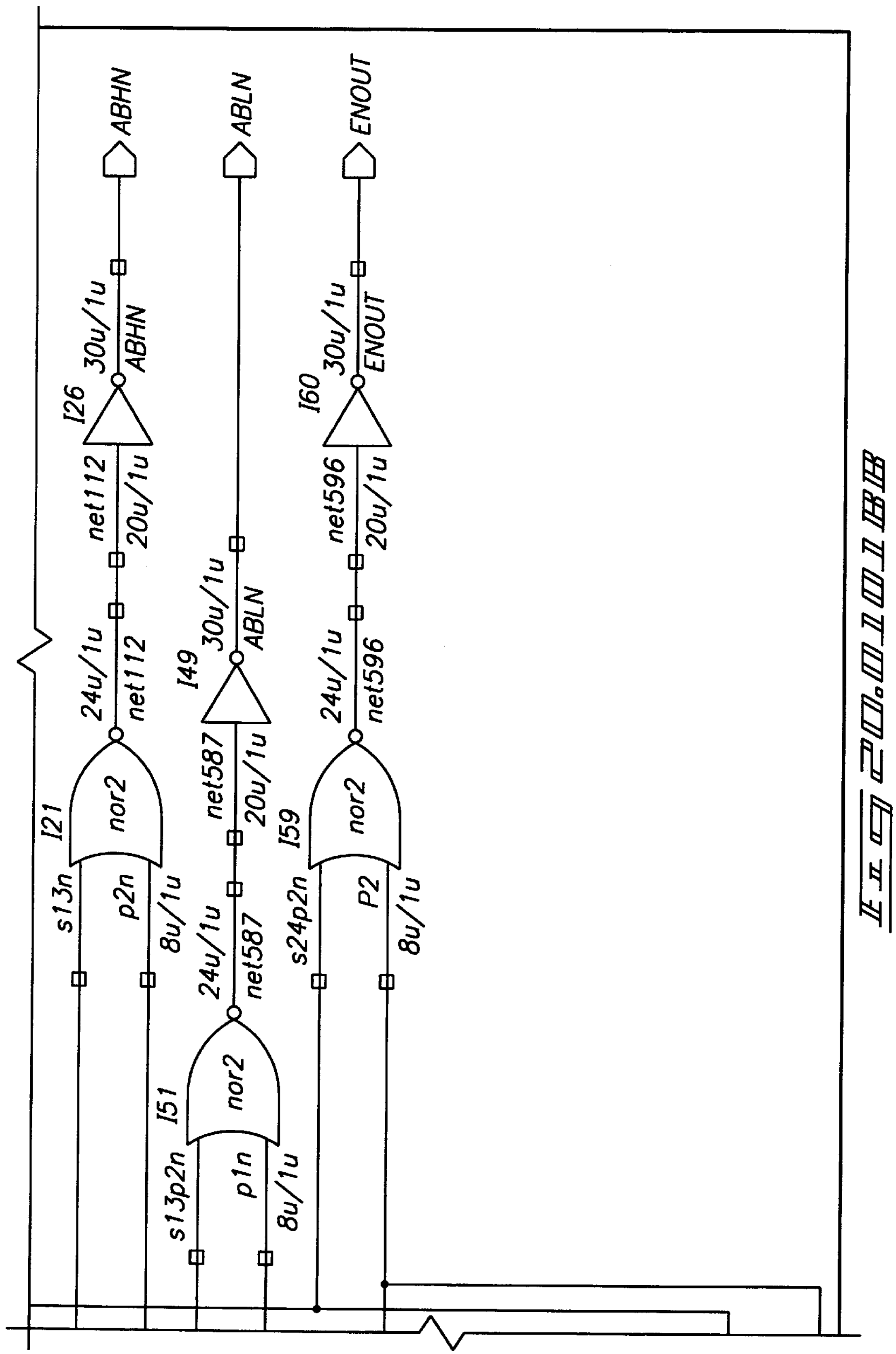
Fig 20.0101BB

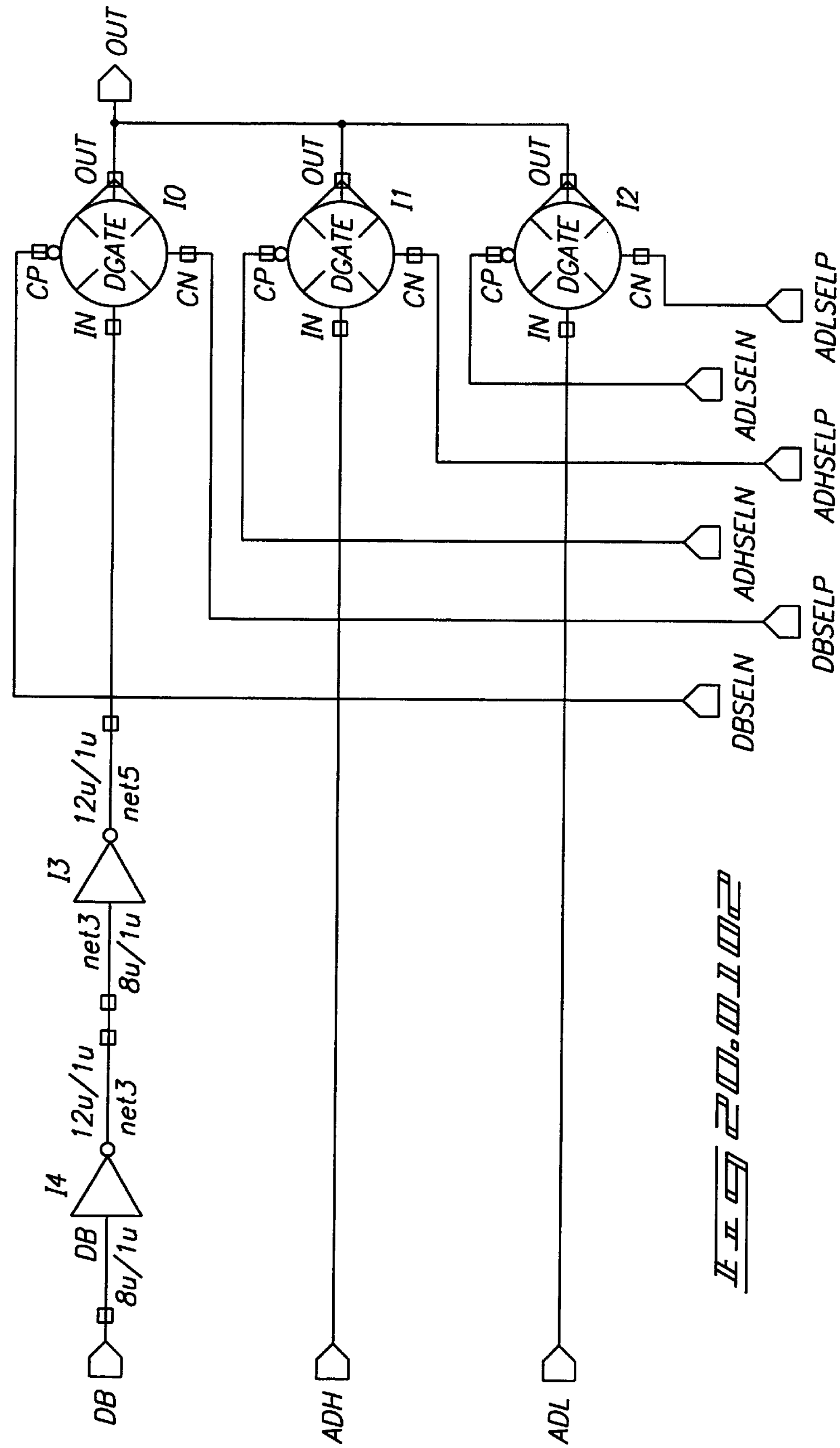
Fig. 20.0102

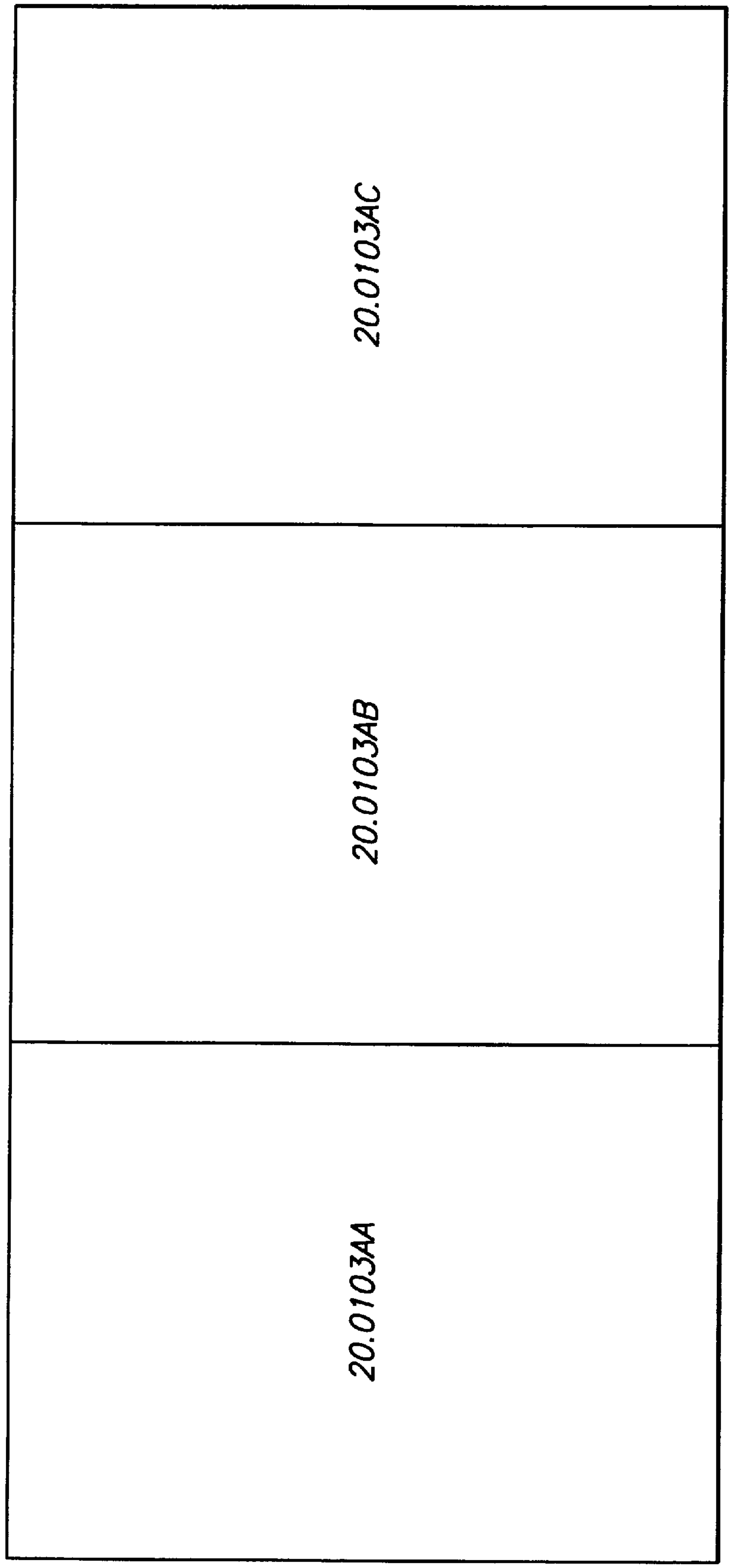
FIG. 20.0103

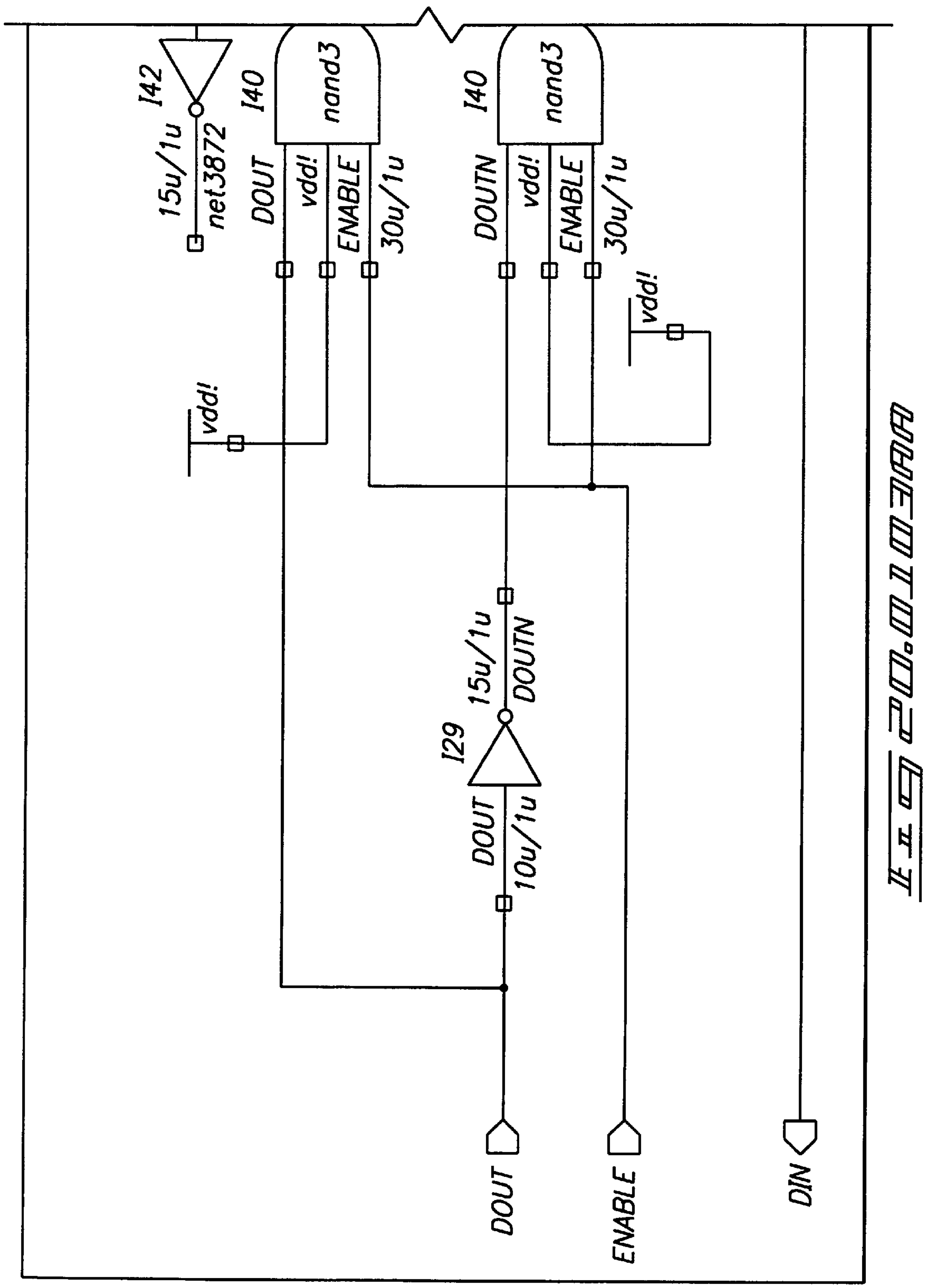
Fig. 20.01.03AAA

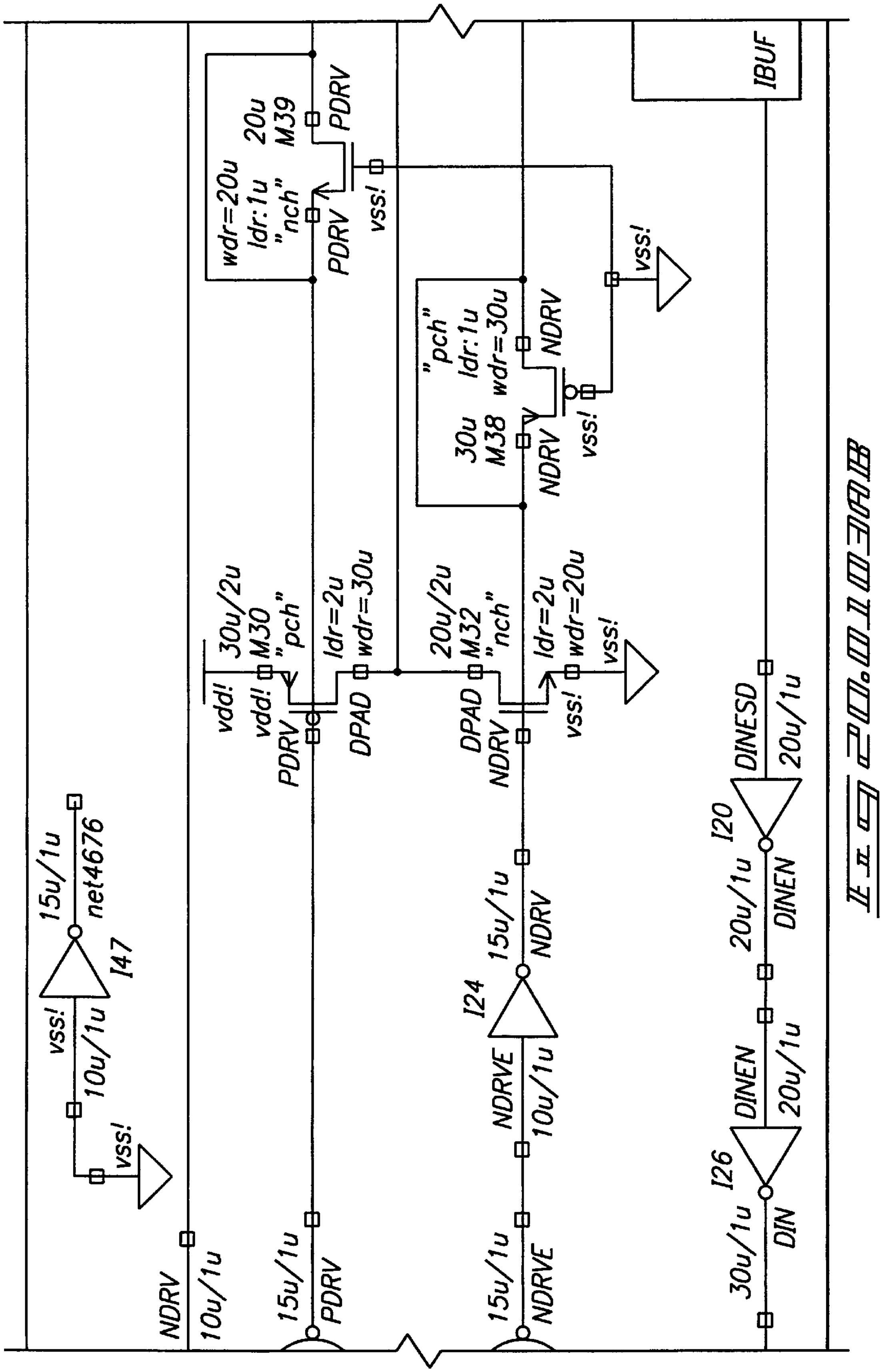
Fig. 20.01.03AB

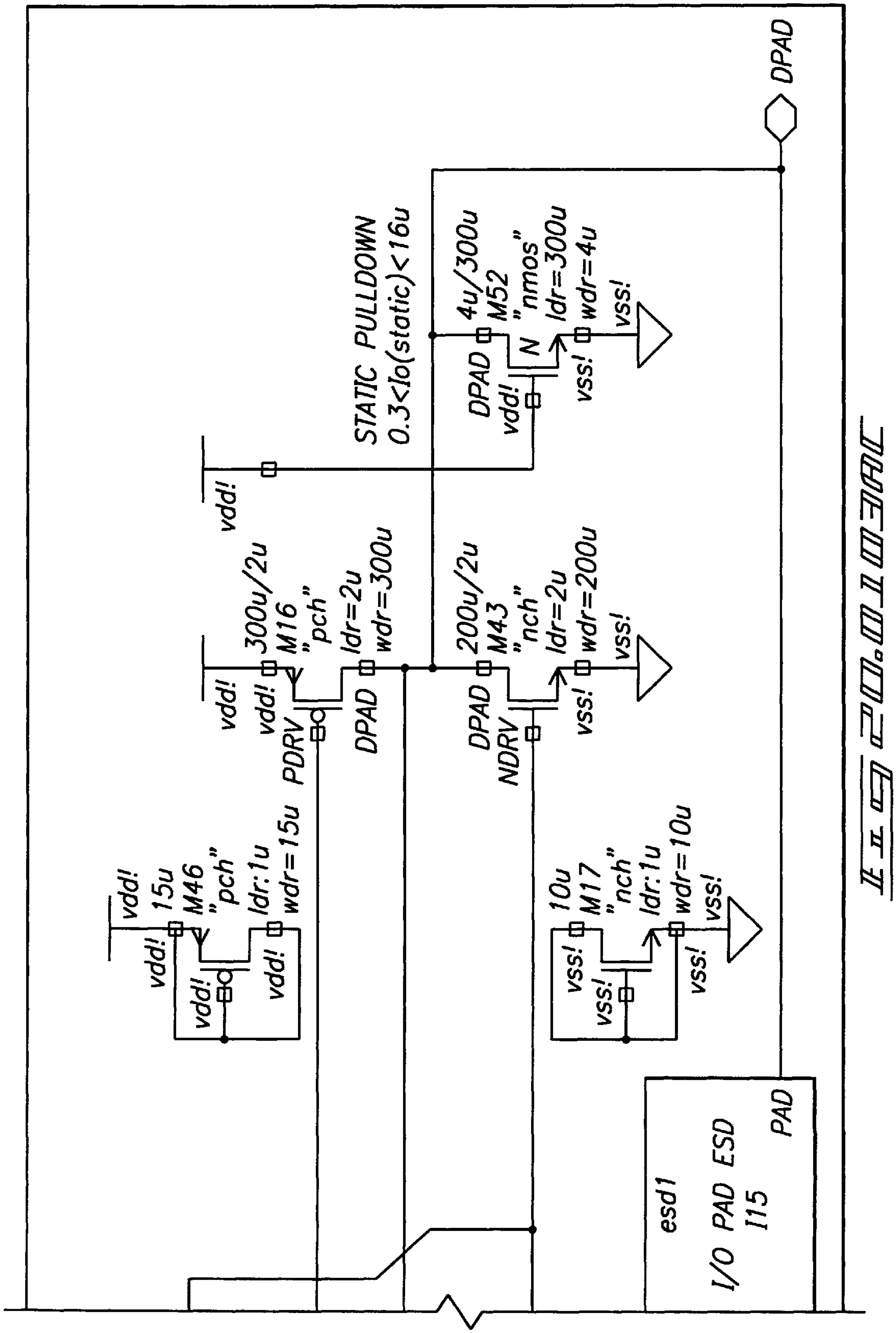
FIG. 20.0103AC

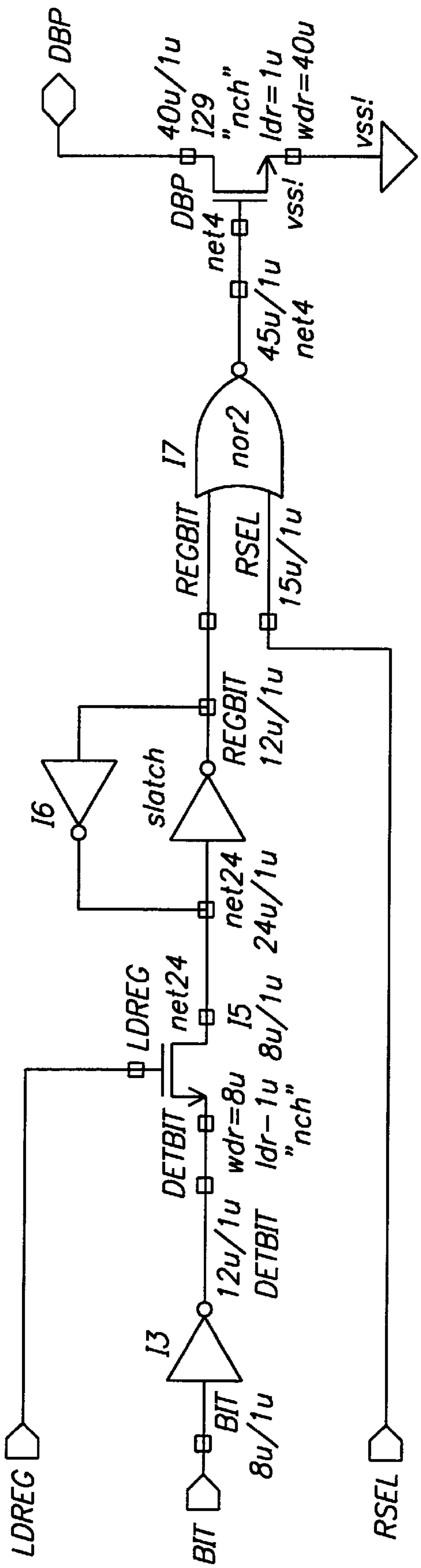
FIG. 20.10A $V_{ref}$ = bandgap voltage ≈ 1.2 V for silicon

WAKEUP SEQUENCE

WAKEUP RX ON
WAKEUP ABORT TESTS
PROCESSOR ON
RX OFF
TX ON
ALL OFF
1uA
750uA
1.8mA
5mA
3.9mA
4.2mA
1uA
10us
50us
LOWRATE:100us
18ms(max)
0ms(min)
36ms(max)
0ms(min)
4.2ms(max)
0.9ms(min)
8.4ms(max)
1.8ms(min)
2.5ms(max)
DPSK MBS:14ms
7.6ms(max)
PREAMBLE
MESSAGE
PREAMBLE (2000 BITS)
MESSAGE
SLEEP MODE
RECEIVE MODE
TRANSMIT MODE
SLEEP MODE 220
248
248
248
246
222
N+
232
234
226
N–
P–
244
230
224
228
N+
222

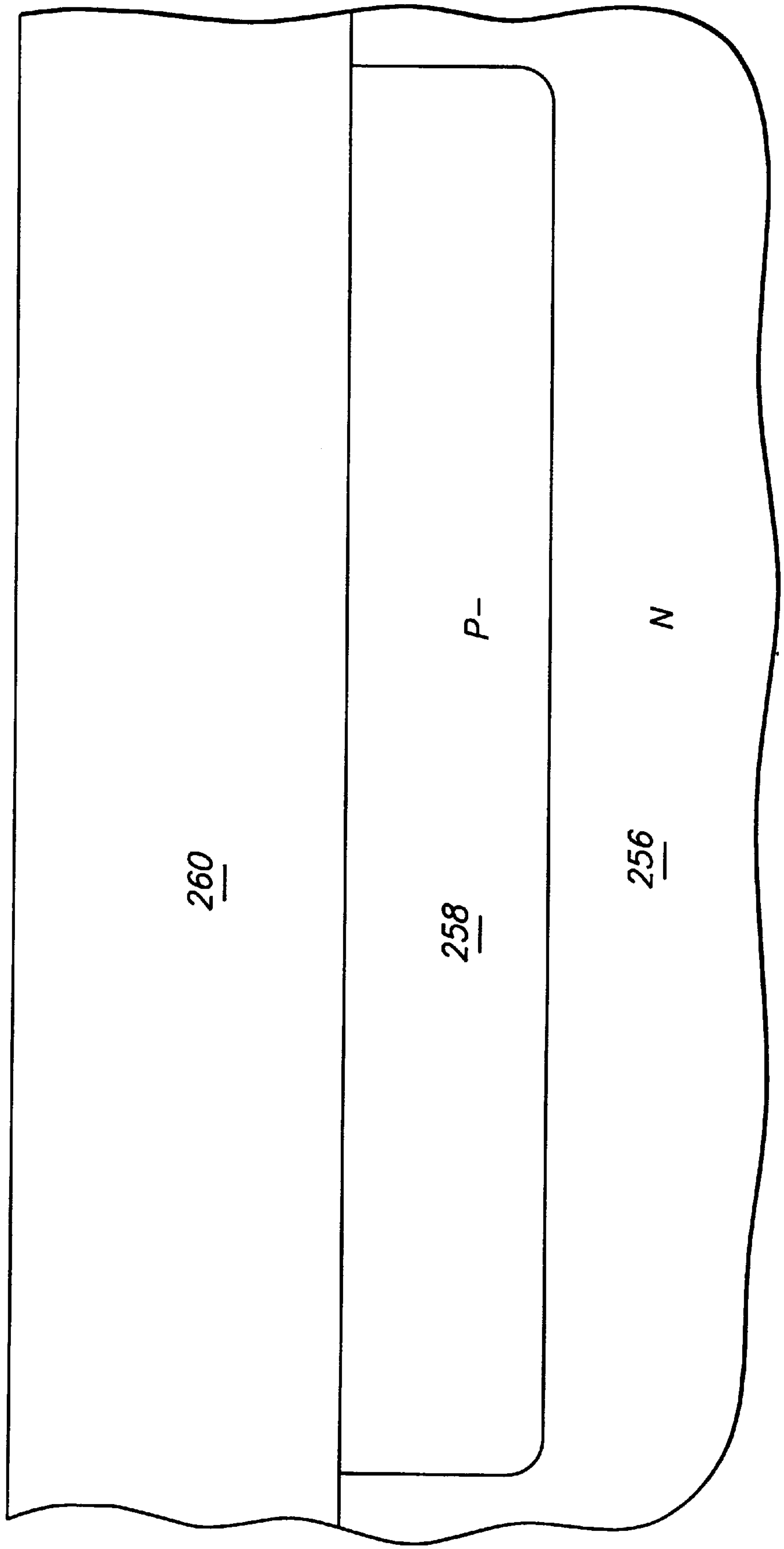
260
258
P–
256
N 260
272
272
272
270
270
270
252
252
P+
P+
268
P–
N
256
254
258

| | | PRESENT STATE | | NEXT STATE | |
|---|---|---|---|---|---|
| ENABLE | TX | Q1 | QØ | D1 | DØ |
| 0 | 0 | 0 | 0 | 0 | 0 |
| 0 | 1 | 0 | 0 | 0 | 0 |
| 1 | 0 | 0 | 0 | 1 | 0 |
| 1 | 1 | 0 | 0 | 0 | 1 |
| X | 0 | 0 | 1 | 0 | 0 |
| X | 1 | 0 | 1 | 0 | 1 |
| X | X | 1 | 1 | 0 | 1 |
| X | 0 | 1 | 0 | 1 | 1 |
| X | 1 | 1 | 0 | 0 | 1 |

Fig 66

| NAME | CURRENT ($\mu A$) | $\Delta V$ (mV) | $\Delta V/V$ CONTROL(NOM) X 100 |
|---|---|---|---|
| COARSE | 40 | 160 | 13.3% |
| MEDIUM | 10 | 40 | 3.3 |
| MEDIUM FINE | 1 | 2.6 | 0.22 |
| FINE | 0.1 | 0.26 | 0.022 |

Fig. 72

STAGE HAVING CONTROLLED VARIABLE RESISTANCE LOAD CIRCUIT FOR USE IN VOLTAGE CONTROLLED RING OSCILLATOR

CROSS REFERENCE TO RELATED APPLICATION

This is a Continuation of U.S. patent application Ser. No. 09/153,014, filed Sep. 14, 1998, and titled "Stage Having Controlled Variable Resistance Load Circuit for Use in Voltage Controlled Ring Oscillator," which in turn is a Division of U.S. patent application Ser. No. 08/705,043, filed Aug. 29, 1996, now U.S. Pat. No. 6,130,602, which claims priority from U.S. Provisional Application No. 60/017,900, filed May 13, 1996, titled "Radio Frequency Data Communication Device.

COPYRIGHT AUTHORIZATION

A portion of the disclosure of this patent document, including the appended microfiche, contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

REFERENCE TO MICROFICHE

Appended hereto is a microfiche copy of a software guide entitled "Micron RFID Systems Developer's Guide," May 2, 1996. This appendix has 5 microfiche providing 266 total frames.

TECHNICAL FIELD

This invention relates to radio frequency communication devices. More particularly, the invention relates to radio frequency identification devices for inventory control, object monitoring, or for determining the existence, location or movement of objects.

BACKGROUND OF THE INVENTION

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. Furthermore, there is a need for tag devices suitably configured to mount to a variety of objects including goods, items, persons, or animals, or substantially any moving or stationary and animate or inanimate object. One way of tracking objects is with an electronic identification system.

One presently available electronic identification system utilizes a magnetic field modulation system to monitor tag devices. An interrogator creates a magnetic field that becomes detuned when the tag device is passed through the magnetic field. In some cases, the tag device may be provided with a unique identification code in order to distinguish between a number of different tags. Typically, the tag devices are entirely passive (have no power supply), which results in a small and portable package. However, this identification system is only capable of distinguishing a limited number of tag devices, over a relatively short range, limited by the size of a magnetic field used to supply power to the tags and to communicate with the tags.

Another electronic identification system utilizes an RF transponder device affixed to an object to be monitored, in which an interrogator transmits an interrogation signal to the device. The device receives the signal, then generates and transmits a responsive signal. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator. For example, RF-based transponder devices tend to be more suitable for inventory control or tracking.

BRIEF DESCRIPTION OF THE DRAWINGS

Preferred embodiments of the invention are described below with reference to the following accompanying drawings. Like names for circuit blocks indicate like components. Where there are a plurality of identical circuit blocks, detailed drawings are provided for one such circuit block. Some circuit schematics have been numbered in a hierarchial manner to reflect the hierarchial nature of these drawings. Notwithstanding the order in which the figures are numbered, note that some detailed drawings provide details to blocks included in more than one higher level drawing. Some circuit schematics have been broken up into many portions due to size requirements for patent drawings.

FIG. 6.01 is a layout diagram illustrating the physical layout of various components on an integrated circuit die, in accordance with one embodiment of the invention. The physical locations and sizes of components relative to other components are shown. Boundaries between various blocks may be approximate in the sense that portions of certain blocks may extend into other blocks.

FIG. 7.01 is a graph illustrating how FIGS. 7.01AA–BB are to be assembled. After such assembly, FIGS. 7.01AA–BB provide a circuit drawing of a processor clock generator "clk" included in the circuit of FIGS. 7AA–HJ.

FIG. 7.0101 is a graph illustrating how FIGS. 7.0101AA–BB are to be assembled. After such assembly, FIGS. 7.0101AA–BB provide a circuit drawing of a processor clock controller "clkctl" included in the circuit of FIGS. 7.01AA–BB.

FIG. 7.0102 is a graph illustrating how FIGS. 7.0102AE–DJ are to be assembled. After such assembly, FIGS. 7.0102AE–DJ provide a circuit drawing of a phase generator "clkph" included in the circuit of FIGS. 7.01AA–BB.

FIG. 7.0103 is a graph illustrating how FIGS. 7.0103AA–BD are to be assembled. After such assembly, FIGS. 7.0103AA–BD provide a circuit drawing of a state generator "clkst" included in the circuit of FIGS. 7.01AA–BB.

FIG. 7.010301 is a graph illustrating how FIGS. 7.010301AA–BB are to be assembled. After such assembly, FIGS. 7.010301AA–BB provide a circuit drawing of a clock generator counter bit "clkcbit" included in the circuit of FIGS. 7.0103AA–BD.

FIG. 7.02 is a graph illustrating how FIGS. 7.02AA–BF are to be assembled. After such assembly, FIGS. 7.02AA–BF provide a circuit drawing of an address decoder "adrdec" included in the circuit of FIGS. 7AA–BF.

FIG. 7.03 is a graph illustrating how FIGS. 7.03AA–EH are to be assembled. After such assembly, FIGS. 7.03AA–EH provide a circuit drawing of a 512 byte RAM "ram" included in the circuit of FIGS. 7AA–HJ.

FIG. 7.0301 is a graph illustrating how FIGS. 7.0301AA–BB are to be assembled. After such assembly, FIGS. 7.0301AA–BB provide a circuit drawing of a RAM control circuit "ramctl" included in the circuit of FIGS. 7.03AA–BB.

FIG. 7.0302 is a graph illustrating how FIGS. 7.0302AA–AC are to be assembled. After such assembly, FIGS. 7.0302AA–AC provide a circuit drawing of an 8×4 RAM array "ram8×4" included in the circuit of FIGS. 7.03AA–EH.

FIG. 7.030201 is a circuit drawing of a six transistor RAM cell "ramcell" included in the circuit of FIGS. 7.0302AA–AC.

FIG. 7.0303 is a graph illustrating how FIGS. 7.0303AA–AD are to be assembled. After such assembly, FIGS. 7.0303AA–AD provide a circuit drawing of a RAM precharge circuit "rampch" included in the circuit of FIGS. 7.03AA–EH.

FIG. 7.0304 is a graph illustrating how FIGS. 7.0304AA–AD are to be assembled. After such assembly, FIGS. 7.0304AA–AD provide a circuit drawing of a second RAM precharge circuit "ramdch" included in the circuit of FIGS. 7.03AA–EH.

FIG. 7.0305 is a circuit drawing of a RAM address buffer "ramadb" included in the circuit of FIGS. 7.03AA–EH.

FIG. 7.0306 is a graph illustrating how FIGS. 7.0306AA–BA are to be assembled. After such assembly, FIGS. 7.0306AA–BA provide a circuit drawing of a RAM word line driver "ramwdr" included in the circuit of FIGS. 7.03AA–EH.

FIG. 7.0307 is a graph illustrating how FIGS. 7.0307AA–BB are to be assembled. After such assembly, FIGS. 7.0307AA–BB provide a circuit drawing of a RAM word line decoder "ramwdec" included in the circuit of FIGS. 7.03AA–EH.

FIG. 7.0308 is a graph illustrating how FIGS. 7.0308AA–BB are to be assembled. After such assembly, FIGS. 7.0308AA–BB provide a circuit drawing of a RAM column select decode r8 circuit "ramcdec" included in the circuit of FIGS. 7.03AA–EH.

FIG. 7.0309 is a graph illustrating how FIGS. 70309AA–BG are to be assembled. After such assembly, FIGS. 7.0309AA–BG provide a circuit drawing of a RAM column selector "ramcsel" included in the circuit of FIGS. 7.03AA–EH.

FIG. 7.0310 is a graph illustrating how FIGS. 7.0310AA–BB are to be assembled. After such assembly, FIGS. 7.0310AA–BB provide a circuit drawing of a RAM databus interface "ramdb" included in the circuit of FIGS. 7.03AA–EH.

FIG. 7.04 is a graph illustrating how FIGS. 7.04AA–HJ are to be assembled. After such assembly, FIGS. 7.04AA–HJ provide a circuit drawing of a ROM "rom" included in the circuit of FIGS. 7AA–HJ.

FIG. 7.0401 is a graph illustrating how FIGS. 7.0401AA–BB are to be assembled. After such assembly, FIGS. 7.0401AA–BB provide a circuit drawing of a ROM control logic circuit "romctl" included in the circuit of FIGS. 7.04AA–HJ.

FIG. 7.0402 is a graph illustrating how FIGS. 7.0402AA–AB are to be assembled. After such assembly, FIGS. 7.0402AA–AB provide a circuit drawing of a ROM bit line precharge circuit "rompch" included in the circuit of FIGS. 7.04AA–HJ.

FIG. 7.0403 is a graph illustrating how FIGS. 7.0403AA–BB are to be assembled. After such assembly, FIGS. 7.0403AA–BB provide a circuit drawing of a ROM word line driver "romwdr" included in the circuit of FIGS. 7.04AA–HJ.

FIG. 7.0404 is a graph illustrating how FIGS. 7.0404AB–DC are to be assembled. After such assembly, FIGS. 7.0404AA–DC provide a circuit drawing of a ROM word block decoder "romwdec_rev" included in the circuit of FIGS. 7.04AA–HJ.

FIG. 7.0405 is a graph illustrating how FIGS. 7.0405AA–BA are to be assembled. After such assembly, FIGS. 7.0405AA–BA provide a circuit drawing of a ROM bit line address driver "rombldr" included in the circuit of FIGS. 7.04AA–HJ.

FIG. 7.0406 is a graph illustrating how FIGS. 7.0406AA–CK are to be assembled. After such assembly, FIGS. 7.0406AA–CK provide a circuit drawing of a ROM bit line decoder "rombldec" included in the circuit of FIGS. 7.04AA–HJ.

FIG. 7.0407 is a graph illustrating how FIGS. 7.0407AA–AB are to be assembled. After such assembly, FIGS. 7.0407AA–AB provide a circuit drawing of a ROM sense amplifier "romsns" included in the circuit of FIGS. 7.04AA–HJ.

FIG. 7.05 is a graph illustrating how FIGS. 7.05AA–CB are to be assembled. After such assembly, FIGS. 7.05AA–CB provide a circuit drawing of an instruction register "insreg" included in the circuit of FIGS. 7AA–HJ.

FIG. 7.0501 is a graph illustrating how FIGS. 7.0501AA–AB are to be assembled. After such assembly, FIGS. 7.0501AA–AB provide a circuit drawing of an instruction register cell insrcel" included in the circuit of FIGS. 7.05AA–CB.

FIG. 7.06 is a graph illustrating how FIGS. 7.06AA–CN are to be assembled. After such assembly, FIGS. 7.06AA–CN provide a circuit drawing of an instruction decoder PLA "insdec" included in the circuit of FIGS. 7AA–HJ.

FIG. 7.0601 is a graph illustrating how FIGS. 7.0601AA–HI are to be assembled. After such assembly, FIGS. 7.0601AA–HI provide a circuit drawing of an instruction decoder "insdec" included in the circuit of FIGS. 7AA–HJ.

FIG. 7.0602 is a graph illustrating how FIGS. 7.0602AA–JH are to be assembled. After such assembly, FIGS. 7.0602AA–JH provide a circuit drawing of an instruction decoder (second section) "insdec2" included in the circuit of FIGS. 7AA–HJ.

FIG. 7.0603 is a graph illustrating how FIGS. 7.0603AA–JI are to be assembled. After such assembly, FIGS. 7.0603AA–JI provide a circuit drawing of an instruction decoder (third section) "insdec3" included in the circuit of FIGS. 7AA–HJ.

FIG. 7.0604 is a graph illustrating how FIGS. 7.0604AA–JI are to be assembled. After such assembly, FIGS. 7.0604AA–JI provide a circuit drawing of an instruction decoder (fourth section) "insdec4" included in the circuit of FIGS. 7AA–HJ.

FIG. 7.060401 is a circuit drawing of an instruction decoder ROM amp "insramp" included in the circuit of FIGS. 7.0604AA–JI.

FIG. 7.060402 is a circuit drawing of an instruction decoder PLA amp "inspamp" included in the circuit of FIGS. 7.0604AA–JI.

FIG. 7.060403 is a circuit drawing of an instruction decoder PLA latch "insplat" included in the circuit of FIGS. 7.0604AA–JI.

FIG. 7.07 is a graph illustrating how FIGS. 7.07AA–BB are to be assembled. After such assembly, FIGS. 7.07AA–BB provide a circuit drawing of a conditional qualifier decoder "cqualdec" included in the circuit of FIGS. 7AA–HJ.

FIG. 7.08 is a graph illustrating how FIGS. 7.08AA–CA are to be assembled. After such assembly, FIGS. 7.08AA–CA provide a circuit drawing of a databus latch/precharge circuit "dblatch" included in the circuit of FIGS. 7AA–HJ.

FIG. 7.09 is a graph illustrating how FIGS. 7.09AA–BF are to be assembled. After such assembly, FIGS. 7.09AA–BF provide a circuit drawing of an arithmetic logic unit "alu" included in the circuit of FIGS. 7AA–HJ.

FIG. 7.0901 is a graph illustrating how FIGS. 7.0901AA–CE are to be assembled. After such assembly, FIGS. 7.0901AA–CE provide a circuit drawing of an ALU low byte "alubytl" included in the circuit of FIGS. 7.09AA–BF.

FIG. 7.090101 is a graph illustrating how FIGS. 7.090101AA–AD are to be assembled. After such assembly, FIGS. 7.090101AA–AD provide a circuit drawing of a bit "alubitl" included in the circuit of FIGS. 7.0901AA–CE.

FIG. 7.09010101 is a circuit drawing of an ALU bit decoder cell "alubdec" included in the circuit of FIGS. 7.090101AA–AD.

FIG. 7.09010102 is a circuit drawing of an ALU B register cell "alubcell" included in the circuit of FIGS. 7.090101AA–AD.

FIG. 7.09010103 is a graph illustrating how FIGS. 7.09010103AA–AB are to be assembled. After such assembly, FIGS. 7.09010103AA–AB provide a circuit drawing of an ALU A register cell "aluacell" included in the circuit of FIGS. 7.090101AA–AD.

FIG. 7.09010104 is a graph illustrating how FIGS. 7.09010104AA–AB are to be assembled. After such assembly, FIGS. 7.09010104AA–AB provide a circuit drawing of an ALU register cell "alupc" included in the circuit of FIGS. 7.090101AA–AD.

FIG. 7.09010105 is a circuit drawing of an ALU register cell "alurcell" included in the circuit of FIGS. 7.090101AA–AD. Such register cells are used for a stack pointer and data pointer.

FIG. 7.09010106 is a graph illustrating how FIGS. 7.09010106AA–AB are to be assembled. After such assembly, FIGS. 7.09010106AA–AB provide a circuit drawing of an ALU memory address register "alumar" included in the circuit of FIGS. 7.090101AA–AD.

FIG. 7.09010107 is a circuit drawing of an ALU slave cell "aluslave" included in the circuit of FIGS. 7.090101AA–AD.

FIG. 7.09010108 is a graph illustrating how FIGS. 7.09010108AA–BC are to be assembled. After such assembly, FIGS. 7.09010108AA–BC provide a circuit drawing of an ALU adder "aluadd" included in the circuit of FIGS. 7.090101AA–AD.

FIG. 7.0902 is a graph illustrating how FIGS. 7.0902AA–BD are to be assembled. After such assembly, FIGS. 7.0902AA–BD provide a circuit drawing of an ALU high byte "alubyth" included in the circuit of FIGS. 7.09AA–BF.

FIG. 7.090201 is a graph illustrating how FIGS. 7.090201AA–AC are to be assembled. After such assembly, FIGS. 7.090201AA–AC provide a circuit drawing of a bit "alubith" included in the circuit of FIGS. 7.09AA–BF.

FIG. 7.10 is a graph illustrating how FIGS. 7.10AA–CC are to be assembled. After such assembly, FIGS. 7.10AA–CC provide a circuit drawing of a timed lockout divider "tld" included in the circuit of FIGS. 7AA–HJ.

FIG. 7.1001 is a circuit drawing of a timed lockout divider cell "tldcel" included in the circuit of FIGS. 7.10AA–CC.

FIG. 7.11 is a graph illustrating how FIGS. 7.11AA–AB are to be assembled. After such assembly, FIGS. 7.11AA–AB provide a circuit drawing of a timed lockout register "tloreg" included in the circuit of FIGS. 7AA–HJ.

FIG. 7.1101 is a graph illustrating how FIGS. 7.1101AA–AC are to be assembled. After such assembly, FIGS. 7.1101AA–AC provide a circuit drawing of a timed lockout register cell "tlorcel" included in the circuit of FIGS. 7.11AA–AB.

FIG. 7.12 is a graph illustrating how FIGS. 7.12AA–AC are to be assembled. After such assembly, FIGS. 7.12AA–AC provide a circuit drawing of a R/W control register "oreg" included in the circuit of FIGS. 7AA–HJ.

FIG. 7.1201 is a circuit drawing of a R/W control register cell "regcell" included in the circuit of FIGS. 7.12AA–AC.

FIG. 7.13 is a graph illustrating how FIGS. 7.13AA–BA are to be assembled. After such assembly, FIGS. 7.13AA–BA provide a circuit drawing of a status register "sreg" included in the circuit of FIGS. 7AA–HJ.

FIG. 7.1301 is a circuit drawing of a status register cell "sregcel" included in the circuit of FIGS. 7.13AA–BA.

FIG. 7.14 is a graph illustrating how FIGS. 7.14AA–AB are to be assembled. After such assembly, FIGS. 7.14AA–AB provide a circuit drawing of a serial input/output block "sio" included in the circuit of FIGS. 7AA–HJ.

FIG. 7.1401 is a graph illustrating how FIGS. 7.1401AA–GF are to be assembled. After such assembly, FIGS. 7.1401AA–GF provide a circuit drawing of a serial input/output data path "siodata" included in the circuit of FIGS. 7.14AA–AB.

FIG. 7.140101 is a graph illustrating how FIGS. 7.140101AA–AB are to be assembled. After such assembly, FIGS. 7.140101AA–AB provide a circuit drawing of a serial input/output register cell "sioreg" included in the circuit of FIGS. 7.1401AA–AB.

FIG. 7.140102 is a circuit drawing of a serial input/output XOR circuit "sioxor" included in the circuit of FIGS. 7.1401AA–GF.

FIG. 7.140103 is a graph illustrating how FIGS. 7.140103AA–AB are to be assembled. After such assembly, FIGS. 7.140103AA–AB provide a circuit drawing of a bidirectional latch "siobdlat_inv" included in the circuit of FIGS. 7.1401AA–GF.

FIG. 7.140104 is a graph illustrating how FIGS. 7.140104AA–AB are to be assembled. After such assembly, FIGS. 7.140104AA–AB provide a circuit drawing of a shift register "sioshr" "included in the circuit of FIGS. 7.1401AA–GF.

FIG. 7.140105 is a graph illustrating how FIGS. 7.140105AA–AB are to be assembled. After such assembly, FIGS. 7.140105AA–AB provide a circuit drawing of a bidirectional latch "siobdlat" included in the circuit of FIGS. 7.1401AA–GF.

FIG. 7.1402 is a graph illustrating how FIGS. 7.1402BA–EI are to be assembled. After such assembly, FIGS. 7.1402BA–EI provide a circuit drawing of serial input/output control logic "sioctli included in the circuit of FIGS. 7.14AA–AB.

FIG. 7.140201 is a graph illustrating how FIGS. 7.140201AA–BB are to be assembled. After such assembly, FIGS. 7.140201AA–BB provide a circuit drawing of a counter bit "siocbit" included in the circuit of FIGS. 7.1402AA–AB FIG. 7.15 is a graph illustrating how FIGS. 7.15AA–EC are to be assembled. After such assembly, FIGS. 7.15AA–EC provide a circuit drawing of a data interleaver (which interleaves two thirteen bit words) "dil" included in the circuit of FIGS. 7AA–HJ.

FIG. 7.1501 is a graph illustrating how FIGS. 7.1501AA–CA are to be assembled. After such assembly, FIGS. 7.1501AA–CA provide a circuit drawing of a data interleaver shift register "dil_sreg" included in the circuit of FIGS. 7.15AA–EC.

FIG. 7.1502 is a graph illustrating how FIGS. 7.1502AA–CA are to be assembled. After such assembly, FIGS. 7.1502AA–CA provide a circuit drawing of a data interleaver shift register with parallel load "dil_plsreg" included in the circuit of FIGS. 7.15AA–EC.

FIG. 7.150201 is a circuit drawing of a data interleaver shift register bit "dil_sregbit included in the circuit of FIGS. 7.1502AA–CA.

FIG. 7.16 is a graph illustrating how FIGS. 7.16AA–CD are to be assembled. After such assembly, FIGS. 7.16AA–CD provide a circuit drawing of a convolutional encoder and preamble generator "conv" included in the circuit of FIGS. 7AA–HJ.

FIG. 7.1601 is a circuit drawing of a shift register cell "convshr" included in the circuit of FIGS. 7.16AA–CD.

FIG. 7.1602 is a circuit drawing of a summer "convsum" included in the circuit of FIGS. 7.16AA–CD.

FIG. 7.17 is a graph illustrating how FIGS. 7.17AA–BB are to be assembled. After such assembly, FIGS. 7.17AA–BB provide a circuit drawing of a shift register input data MUX "shdcel" included in the circuit of FIGS. 7AA–HJ.

FIG. 7.18 is a graph illustrating how FIGS. 7.18AA–CC are to be assembled. After such assembly, FIGS. 7.18AA–CC provide a circuit drawing of a digital port output controller "doutport" included in the circuit of FIGS. 7AA–HJ.

FIG. 8.01 is a graph illustrating how FIGS. 8.01AA–DE are to be assembled. After such assembly, FIGS. 8.01AA–DE provide a circuit drawing of a receiver "rx" included in the circuit of FIGS. 8AA–CB.

FIG. 8.0101 is a graph illustrating how FIGS. 8.0101AA–CB are to be assembled. After such assembly, FIGS. 8.0101AA–CB provide a circuit drawing of a Schottky diode detector "diodedet" included in the circuit of FIGS. 8.01AA–DE.

FIG. 8.0102 is a graph illustrating how FIGS. 8.0102AA–BD are to be assembled. After such assembly, FIGS. 8.0102AA–BD provide a circuit drawing of a CMOS square law detector "cmosdet" included in the circuit of FIGS. 8.01AA–DE.

FIG. 8.0103 is a graph illustrating how FIGS. 8.0103AA–CF are to be assembled. After such assembly, FIGS. 8.0103AA–CF provide a circuit drawing of a video amplifier "videoamp1" included in the circuit of FIGS. 8.01AA–DE.

FIG. 8.0104 is a graph illustrating how FIGS. 8.0104AA–BC are to be assembled. After such assembly, FIGS. 8.0104AA–BC provide a circuit drawing of a second video amplifier "videoamp2" included in the circuit of FIGS. 8.01AA–DE.

FIG. 8.0105 is a graph illustrating how FIGS. 8.0105AA–ED are to be assembled. After such assembly, FIGS. 8.0105AA–ED provide a circuit drawing of a comparator "comparator" included in the circuit of FIGS. 8.01AA–DE.

FIG. 8.0106 is a graph illustrating how FIGS. 8.0106AA–CD are to be assembled. After such assembly, FIGS. 8.0106AA–CD provide a circuit drawing of an RF detect circuit "rxdet" included in the circuit of FIGS. 8.01AA–DE.

FIG. 8.0107 is a graph illustrating how FIGS. 8.0107AA–GN are to be assembled. After such assembly, FIGS. 8.0107AA–GN provide a circuit drawing of a receiver bias generator "rxbias" included in the circuit of FIGS. 8.01AA–DE.

FIG. 8.0108 is a graph illustrating how FIGS. 8.0108AA–AC are to be assembled. After such assembly, FIGS. 8.0108AA–AC provide a circuit drawing of a data transition detector "datatx" included in the circuit of FIGS. 8.01AA–DE.

FIG. 8.02 is a graph illustrating how FIGS. 8.02AA–BC are to be assembled. After such assembly, FIGS. 8.02A–BC provide a circuit drawing of a low power frequency locked loop "lpfll" included in the circuit of FIGS. 8AA–CB.

FIG. 8.0201 is a graph illustrating how FIGS. 8.0201AA–AB are to be assembled. After such assembly, FIGS. 8.0201AA–AB provide a circuit drawing of a timed lockout divider cell "tldcel_bypass" included in the circuit of FIGS. 8.02AA–BC.

FIG. 8.0202 is a graph illustrating how FIGS. 8.0202AA–CD are to be assembled. After such assembly, FIGS. 8.0202AA–CD provide a circuit drawing of a low power frequency locked loop frequency comparator "freqcomp" included in the circuit of FIGS. 8.02AA–BC.

FIG. 8.0203 is a graph illustrating how FIGS. 8.0203AA–BC are to be assembled. After such assembly, FIGS. 8.0203AA–BC provide a circuit drawing of an up/down counter "udcounter" included in the circuit of FIGS. 8.02AA–BC.

FIG. 8.020301 is a graph illustrating how FIGS. 8.020301AA–BB are to be assembled. After such assembly, FIGS. 8.020301AA–BB provide a circuit drawing of an adder "udcounter_adder" included in the circuit of FIGS. 8.0203AA–BC.

FIG. 8.020302 is a graph illustrating how FIGS. 8.020302AA–AB are to be assembled. After such assembly, FIGS. 8.020302AA–AB provide a circuit drawing of a D type flip-flop "udcounter_dff" included in the circuit of FIGS. 8.0203AA–BC.

FIG. 8.0204 is a graph illustrating how FIGS. 8.0204AA–EJ are to be assembled. After such assembly, FIGS. 8.0204AA–EJ provide a circuit drawing of a low power current controlled oscillator "lpcco" included in the circuit of FIGS. 8.02AA–BC.

FIG. 8.0205 is a circuit drawing of a timed lockout divider cell "tldcel" included in the circuit of FIGS. 8.02AA–BC.

FIG. 8.03 is a graph illustrating how FIGS. 8.03AA–AB are to be assembled. After such assembly, FIGS. 8.03AA–AB provide a circuit drawing of a counter bit "lpfll_cbit" included in the circuit of FIGS. 8AA–CB.

FIG. 8.04 is a graph illustrating how FIGS. 8.04AA–EE are to be assembled. After such assembly, FIGS. 8.04AA–EE provide a circuit drawing of a receiver wake up controller "rxwu" included in the circuit of FIGS. 8AA–CB.

FIG. 8.0401 is a graph illustrating how FIGS. 8.0401AA–AB are to be assembled. After such assembly, FIGS. 8.0401AA–AB provide a circuit drawing of wake up abort logic "wuabort" included in the circuit of FIGS. 8.04AA–EE.

FIG. 8.040101 is a graph illustrating how FIGS. 8.040101AA–AB are to be assembled. After such assembly, FIGS. 8.040101AA–AB provide a circuit drawing of wake up abort logic counter bit "wuabort cbit" included in the circuit of FIGS. 8.0401AA–AB.

FIG. 8.0402 is a graph illustrating how FIGS. 8.0402AA–AB are to be assembled. After such assembly, FIGS. 8.0402AA–AB provide a circuit drawing of a timed lockout divider cell "tldcel" included in the circuit of FIGS. 8.04AA–EE.

FIG. 8.05 is a graph illustrating how FIGS. 8.05AA–DE are to be assembled. After such assembly, FIGS. 8.05AA–DE provide a circuit drawing of a digital clock and data recovery circuit "dcr" included in the circuit of FIGS. 8AA–CB.

FIG. 8.0501 is a graph illustrating how FIGS. 8.0501AA–BE are to be assembled. After such assembly, FIGS. 8.0501AA–BE provide a circuit drawing of a PLL start-up circuit "dcr_startup" included in the circuit of FIGS. 8.05AA–DE.

FIG. 8.050101 is a graph illustrating how FIGS. 8.050101AA–AB are to be assembled. After such assembly, FIGS. 8.050101AA–AB provide a circuit drawing of a shift register cell "dcr_sreg" included in the circuit of FIGS. 8.0501AA–BE.

FIG. 8.050102 is a graph illustrating how FIGS. 8.050102AA–AB are to be assembled. After such assembly, FIGS. 8.050102AA–AB provide a circuit drawing of a counter bit "dcr_counterbit" included in the circuit of FIGS. 8.0501AA–BE.

FIG. 8.0502 is a graph illustrating how FIGS. 8.0502AA–CD are to be assembled. After such assembly, FIGS. 8.0502AA–CD provide a circuit drawing of a PLL state machine "dcr_statemachine" included in the circuit of FIGS. 8.05AA–DE.

FIG. 8.0503 is a graph illustrating how FIGS. 8.0503AA–FN are to be assembled. After such assembly, FIGS. 8.0503AA–FN provide a circuit drawing of a DCR bias generator "dcr_bias" included in the circuit of FIGS. 8.05AA–DE.

FIG. 8.0504 is a graph illustrating how FIGS. 8.0504AA–EE are to be assembled. After such assembly, FIGS. 8.0504AA–EE provide a circuit drawing of a VCO control voltage generator "dcr_vcocontrol" included in the circuit of FIGS. 8.05AA–DE.

FIG. 8.050401 is a graph illustrating how FIGS. 8.050401AA–CK are to be assembled. After such assembly, FIGS. 8.050401AA–CK provide a circuit drawing of a coarse step generator "dcr_coarsestepgen" included in the circuit of FIGS. 8.0504AA–EE.

FIG. 8.050402 is a graph illustrating how FIGS. 8.050402AA–CJ are to be assembled. After such assembly, FIGS. 8.050402AA–CJ provide a circuit drawing of a medium step generator "dcr_medstepgen" included in the circuit of FIGS. 8.0504AA–EE.

FIG. 8.050403 is a graph illustrating how FIGS. 8.050403AA–BI are to be assembled. After such assembly, FIGS. 8.050403AA–BI provide a circuit drawing of a medium fine step generator "dcr_medfinestepgen" included in the circuit of FIGS. 8.0504AA–EE.

FIG. 8.050404 is a graph illustrating how FIGS. 8.050404AA–BB are to be assembled. After such assembly, FIGS. 8.050404AA–BB provide a circuit drawing of a fine step controller "dcr_finestepctrl" included in the circuit of FIGS. 8.0504AA–EE.

Figure 8:
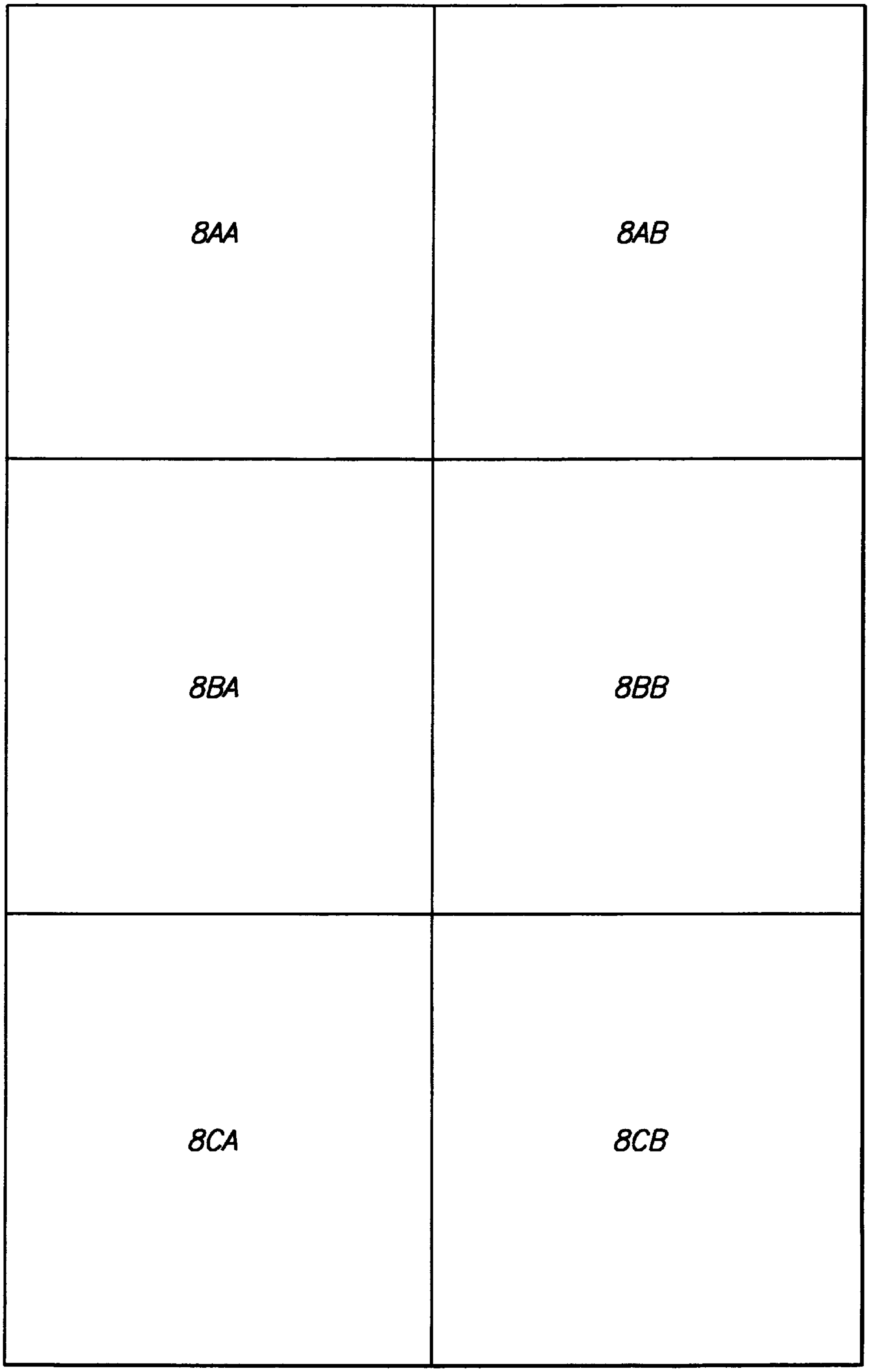
FIG. 8 is a graph illustrating how FIGS. 8AA–CB are to be assembled. After such assembly, FIGS. 8AA–CB provide a circuit drawing of an RF processor "rfproc" included in the circuit of FIGS. 6AA–EK.

FIG. 8.050405 is a graph illustrating how FIGS. 8.050405AA–EJ are to be assembled. After such assembly, FIGS. 8.050405AA–EJ provide a circuit drawing of a fine step generator "dcr_finestepgen" included in the circuit of FIGS. 8.0504AA–EE.

FIG. 8.0505 is a graph illustrating how FIGS. 8.0505AA–EF are to be assembled. After such assembly, FIGS. 8.0505AA–EF provide a circuit drawing of a receiver VCO "dcr_vco" included in the circuit of FIGS. 8.05AA–DE.

FIG. 8.0506 is a graph illustrating how FIGS. 8.0506AA–BB are to be assembled. After such assembly, FIGS. 8.0506AA–BB provide a circuit drawing of an RX clock generator "dcr_rxclkgen" included in the circuit of FIGS. 8.05AA–DE.

FIG. 8.050601 is a circuit drawing of an RX clock generator flip-flop "dcr_rxclkgenff" included in the circuit of FIGS. 8.0506AA–BB.

FIG. 8.0507 is a graph illustrating how FIGS. 8.0507AA–AB are to be assembled. After such assembly, FIGS. 8.0507AA–AB provide a circuit drawing of a PLL non-overlapping clock generator "dcr_clkgen" included in the circuit of FIGS. 8.05AA–DE.

FIG. 8.06 is a graph illustrating how FIGS. 8.06AA–ED are to be assembled. After such assembly, FIGS. 8.06AA–ED provide a circuit drawing of a BPSK/AM/Backscatter transmitter "tx" included in the circuit of FIGS. 8AA–CB.

FIG. 8.0601 is a graph illustrating how FIGS. 8.0601AA–BB are to be assembled. After such assembly, FIGS. 8.0601AA–BB provide a circuit drawing of a transmitter PLL "txpllfsyn" included in the circuit of FIGS. 8.06AA–ED.

FIG. 8.060101 is a graph illustrating how FIGS. 8.060101AA–CC are to be assembled. After such assembly, FIGS. 8.060101AA–CC provide a circuit drawing of a TX phase/frequency detector "txpfdet" included in the circuit of FIGS. 8.0601AA–BB.

FIG. 8.060102 is a graph illustrating how FIGS. 8.060102AA–BB are to be assembled. After such assembly, FIGS. 8.060102AA–BB provide a circuit drawing of a TX PLL charge pump “txchgpump” included in the circuit of FIGS. 8.0601AA–BB.

FIG. 8.060103 is a graph illustrating how FIGS. 8.060103AA–CB are to be assembled. After such assembly, FIGS. 8.060103AA–CB provide a circuit drawing of a TX PLL loop filter “txloopfilter” included in the circuit of FIGS. 8.0601AA–BB.

FIG. 8.060104 is a graph illustrating how FIGS. 8.060104AA–DC are to be assembled. After such assembly, FIGS. 8.060104AA–DC provide a circuit drawing of a TX VCO “txvco” included in the circuit of FIGS. 8.0601AA–BB.

FIG. 8.06010401 is a graph illustrating how FIGS. 8.06010401AA–BD are to be assembled. After such assembly, FIGS. 8.06010401AA–BD provide a circuit drawing of a TX VCO stage “txvcostage” included in the circuit of FIGS. 8.060104AA–DC.

FIG. 8.0601040101 is a graph illustrating how FIGS. 8.0601040101AA–BC are to be assembled. After such assembly, FIGS. 8.0601040101AA–BC provide a layout plot showing how the components of the VCO stage are laid out.

FIG. 8.060105 is a graph illustrating how FIGS. 8.060105AA–DD are to be assembled. After such assembly, FIGS. 8.060105AA–DD provide a circuit drawing of a divider “txdivider” included in the circuit of FIGS. 8.0601AA–BB.

FIG. 8.06010501 is a graph illustrating how FIGS. 8.06010501AA–AB are to be assembled. After such assembly, FIGS. 8.06010501AA–AB provide a circuit drawing of a divider flip-flop “txdivtff” included in the circuit of FIGS. 8.060105AA–DD.

FIG. 8.0602 is a graph illustrating how FIGS. 8.0602AA–AB are to be assembled. After such assembly, FIGS. 8.0602AA–AB provide a circuit drawing of a test mode data selector “txdatasel” included in the circuit of FIGS. 8.06AA–ED.

FIG. 8.0603 is a graph illustrating how FIGS. 8.0603AA–AB are to be assembled. After such assembly, FIGS. 8.0603AA–AB provide a circuit drawing of a BPSK modulation driver “txbpsk” included in the circuit of FIGS. 8.06AA–ED.

FIG. 8.0604 is a graph illustrating how FIGS. 8.0604AA–AB are to be assembled. After such assembly, FIGS. 8.0604AA–AB provide a circuit drawing of a frequency doubler “txdoubler” included in the circuit of FIGS. 8.06AA–ED.

FIG. 8.060401 is a graph illustrating how FIGS. 8.060401AA–FE are to be assembled. After such assembly, FIGS. 8.060401AA–FE provide a circuit drawing of a frequency doubler core “txfdbl” included in the circuit of FIGS. 8.0604AA–ED.

FIG. 8.0605 is a graph illustrating how FIGS. 8.0605AA–AB are to be assembled. After such assembly, FIGS. 8.0605AA–AB provide a circuit drawing of a second frequency doubler “txdoubler2” included in the circuit of FIGS. 8.06AA–ED.

FIG. 8.060501 is a graph illustrating how FIGS. 8.060501AA–CD are to be assembled. After such assembly, FIGS. 8.060501AA–CD provide a circuit drawing of doubler driver amps “txfdbldrv” included in the circuit of FIGS. 8.0605AA–CD.

FIG. 8.060502 is a graph illustrating how FIGS. 8.060502AA–CD are to be assembled. After such assembly, FIGS. 8.060502AA–CD provide a circuit drawing of second doubler driver amps “txfdbldrv2” included in the circuit of FIGS. 8.0605AA–CD.

FIG. 8.060503 is a graph illustrating how FIGS. 8.060503AA–FE are to be assembled. After such assembly, FIGS. 8.060503AA–FE provide a circuit drawing of a frequency doubler core “txfdbl2” included in the circuit of FIGS. 8.0605AA–CD.

FIG. 8.0606 is a graph illustrating how FIGS. 8.0606AA–IE are to be assembled. After such assembly, FIGS. 8.0606AA–IE provide a circuit drawing of a transmitter power amp “txpoweramp” included in the circuit of FIGS. 8.06AA–ED.

FIG. 8.0607 is a graph illustrating how FIGS. 8.0607AA–JJ are to be assembled. After such assembly, FIGS. 8.0607AA–JJ provide a circuit drawing of a transmitter bias generator “txbias” included in the circuit of FIGS. 8.06AA–ED.

FIG. 8.0608 is a graph illustrating how FIGS. 8.0608AA–BB are to be assembled. After such assembly, FIGS. 8.0608AA–BB provide a circuit drawing of a modulated backscatter transmitter “txmbs” included in the circuit of FIGS. 8.06AA–ED.

FIG. 8.07 is a graph illustrating how FIGS. 8.07AA–BB are to be assembled. After such assembly, FIGS. 8.07AA–BB provide a partial circuit drawing of a 915 MHZ transmitter “tx915” included in the circuit of FIGS. 8AA–CB in place of the transmitter “tx” in an alternative embodiment of the invention.

FIG. 8.0701 is a graph illustrating how FIGS. 8.0701AA–CB are to be assembled. After such assembly, FIGS. 8.0701AA–CB provide a circuit drawing of a TX VCO stage “txvcostage915” for use with the 915 MHZ transmitter “tx915” of FIG. 8.07 in place of the TX VCO “txvco” of FIG. 8.060104.

Figure 9:
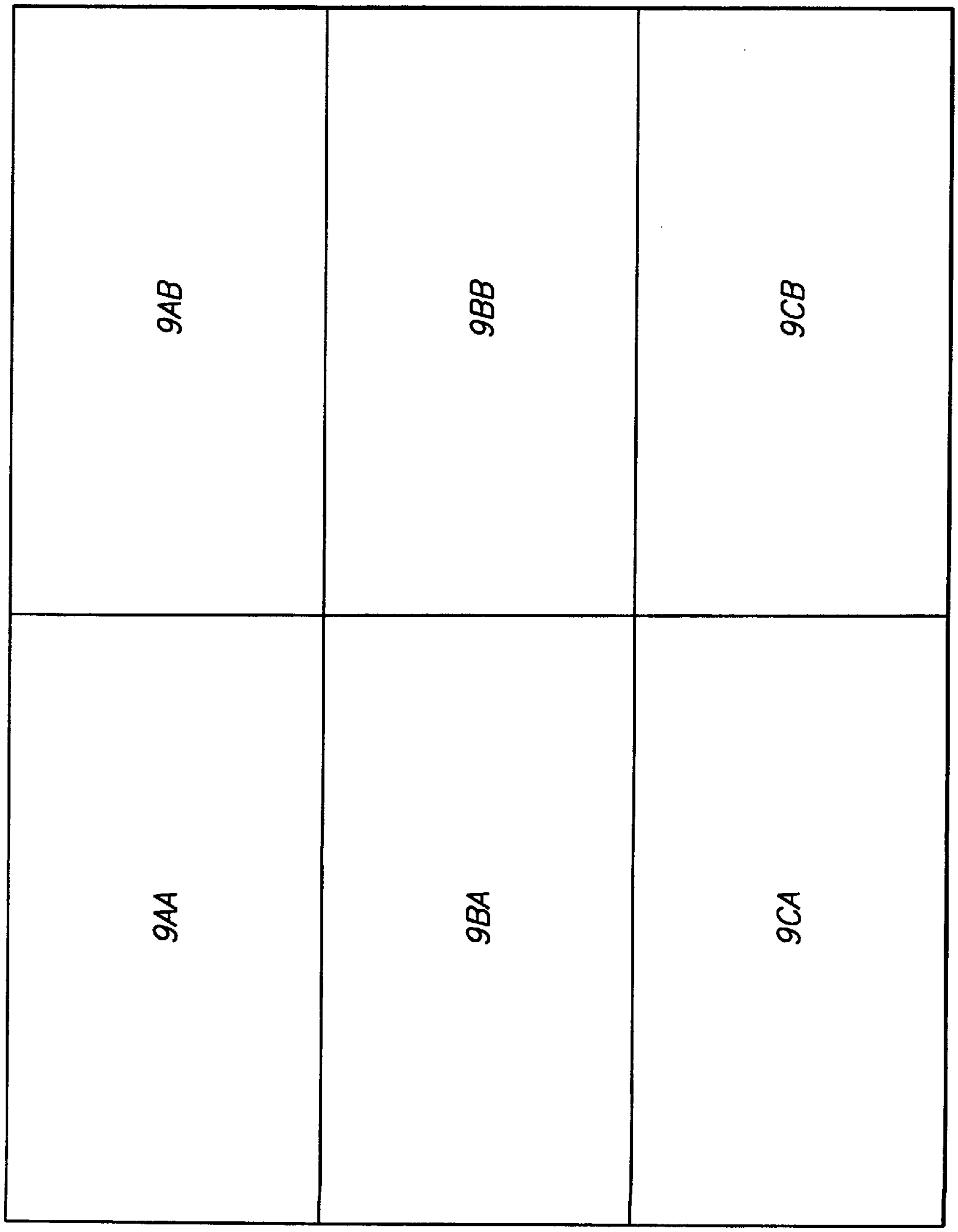
Figure 9A:
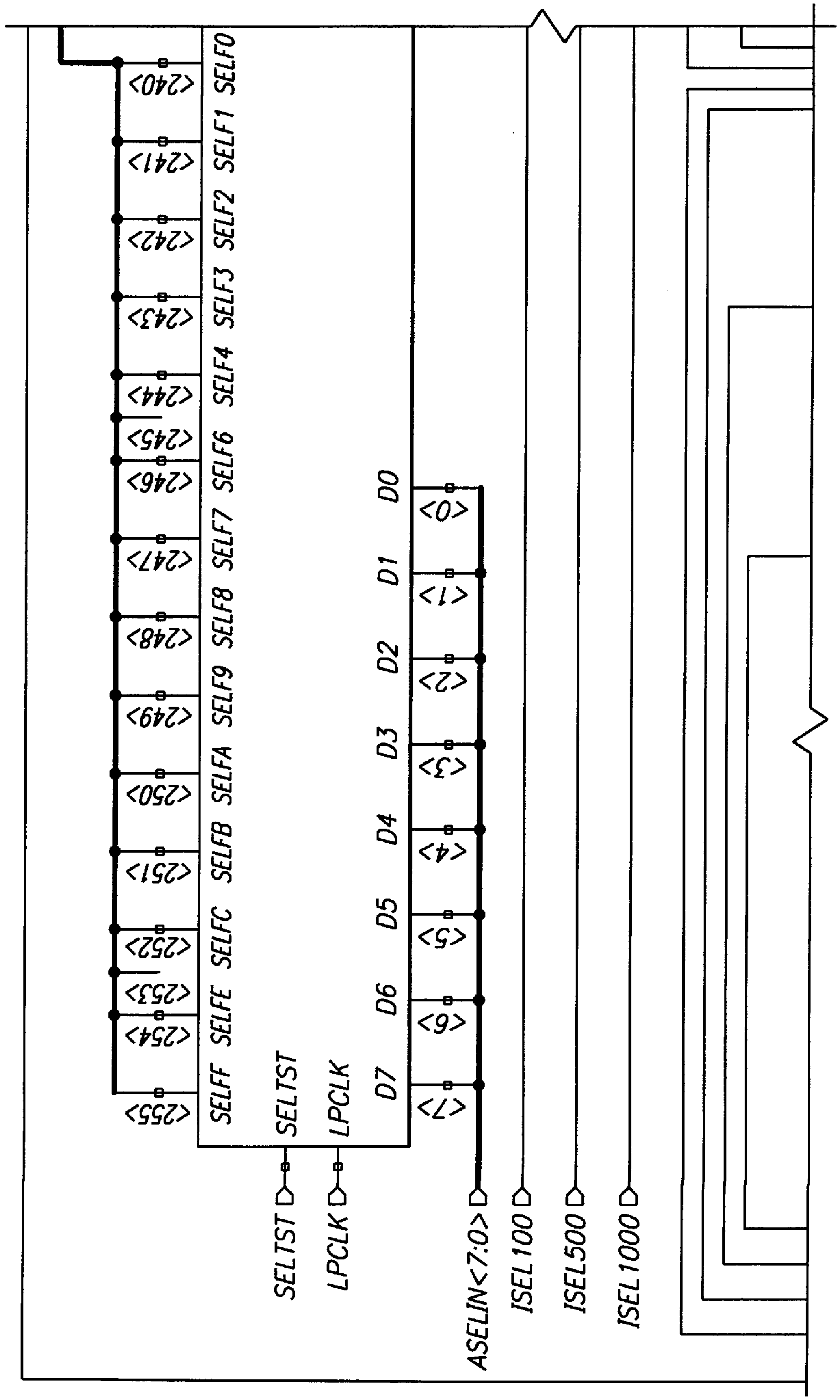
Figure 9A:
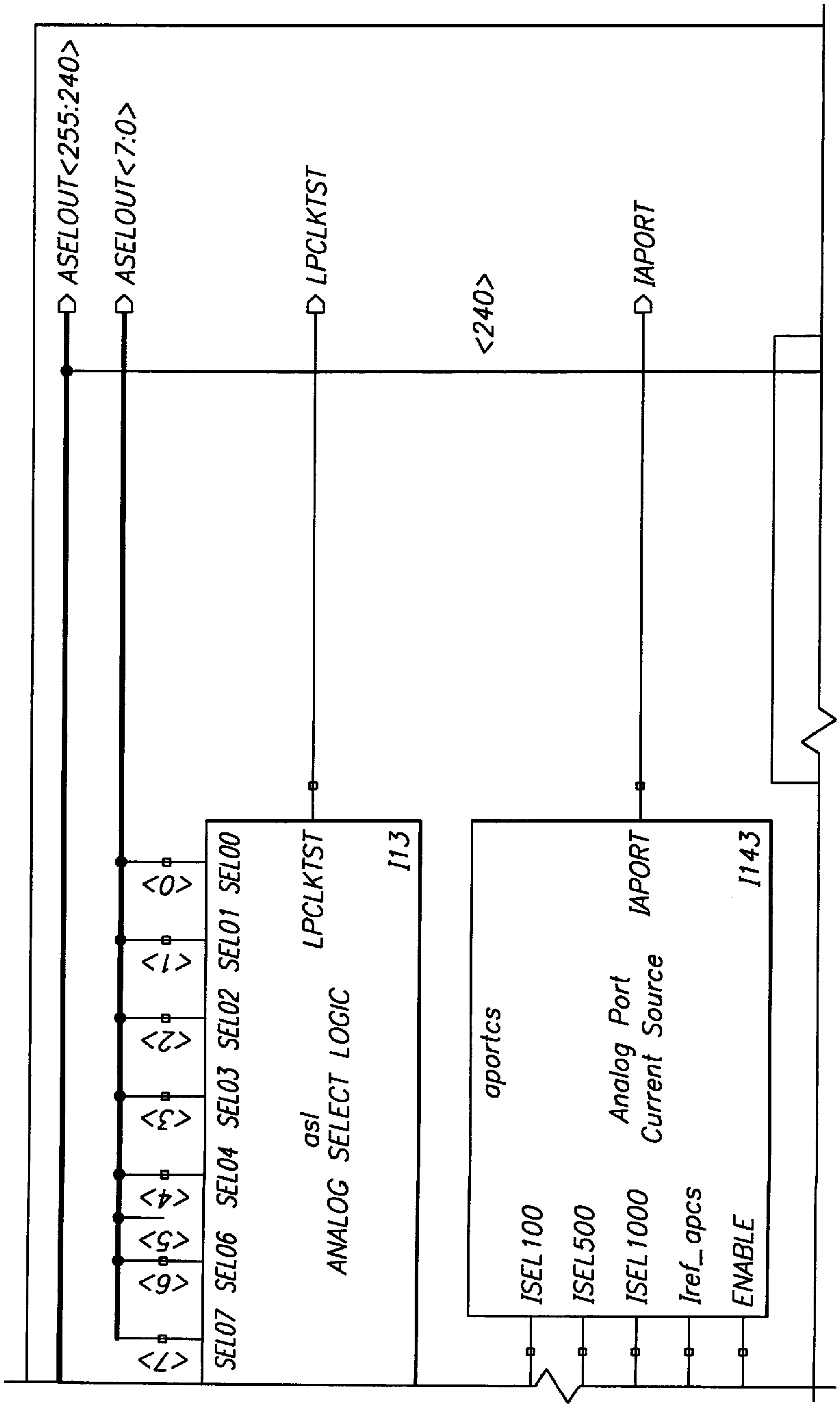
Figure 9B:
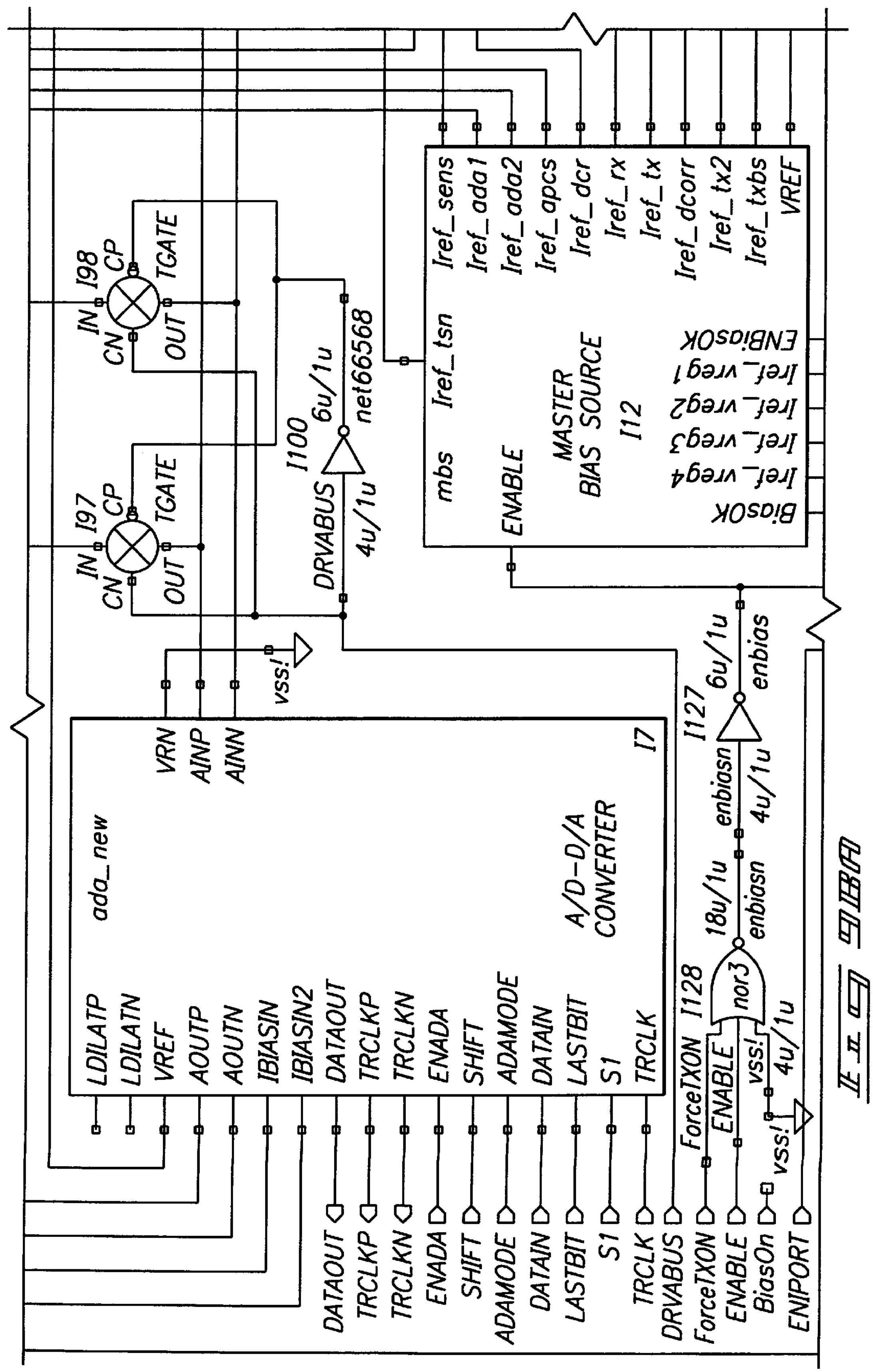
Figure 9B:
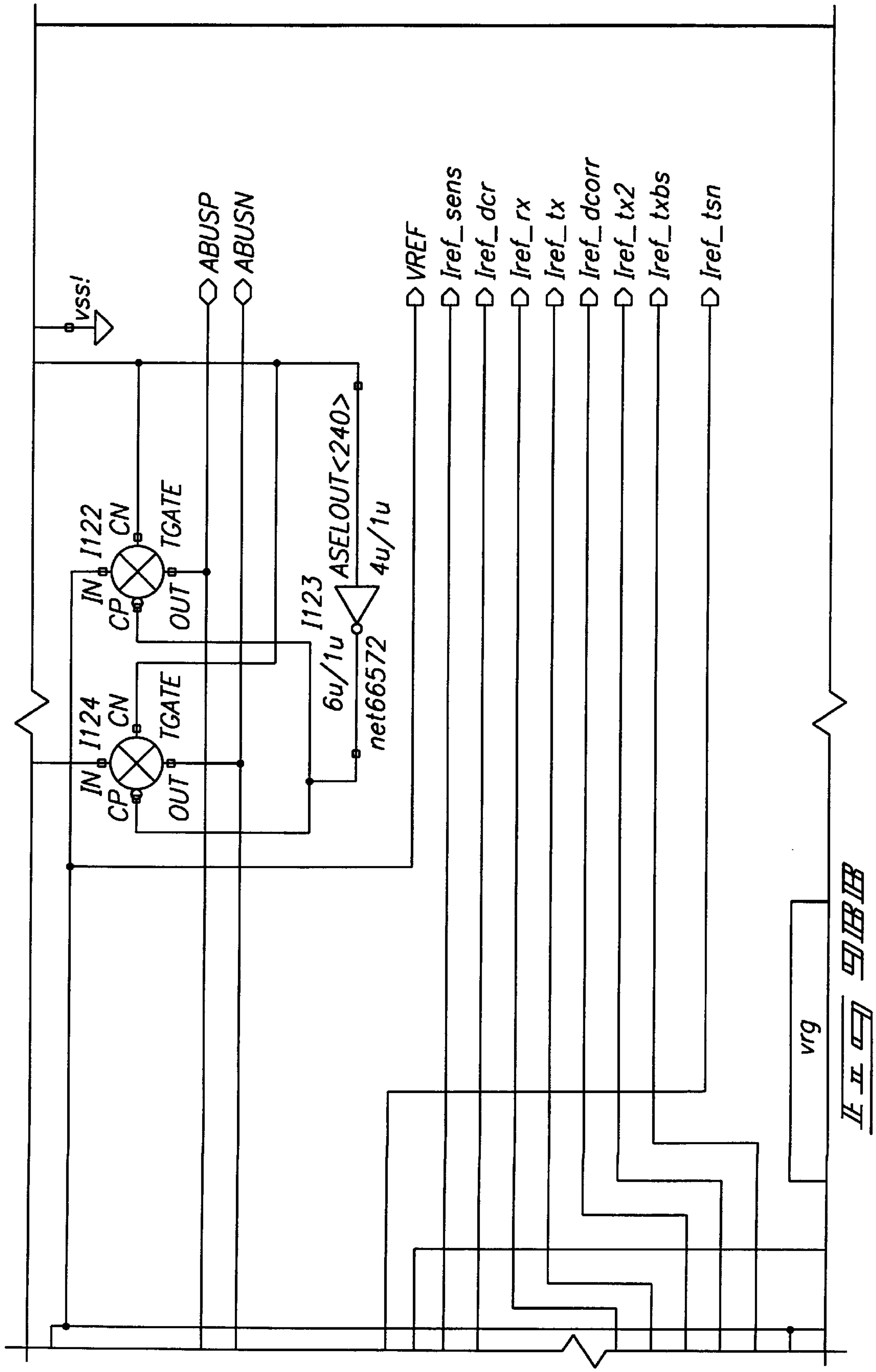
Figure 9C:
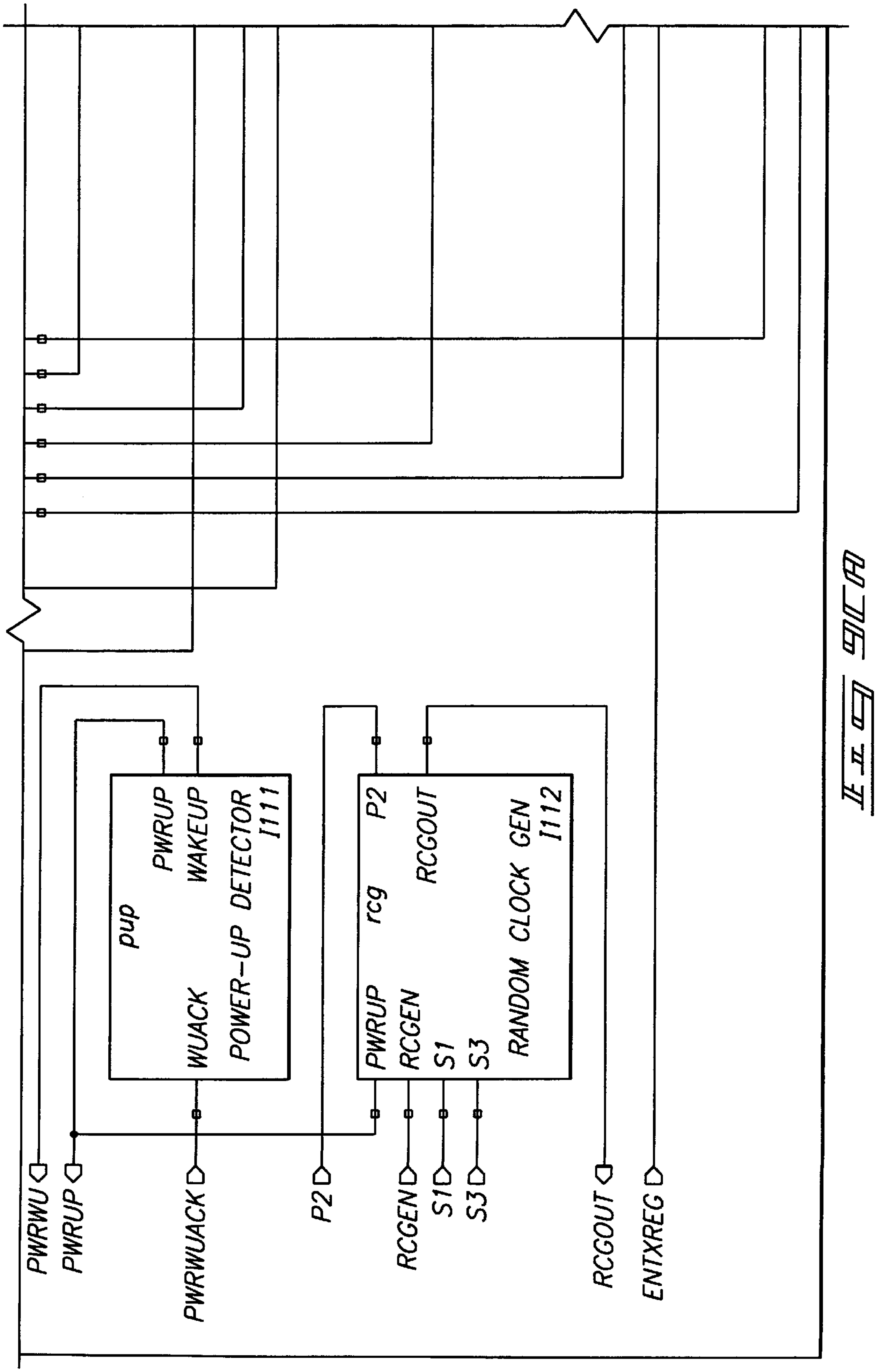
Figure 9C:
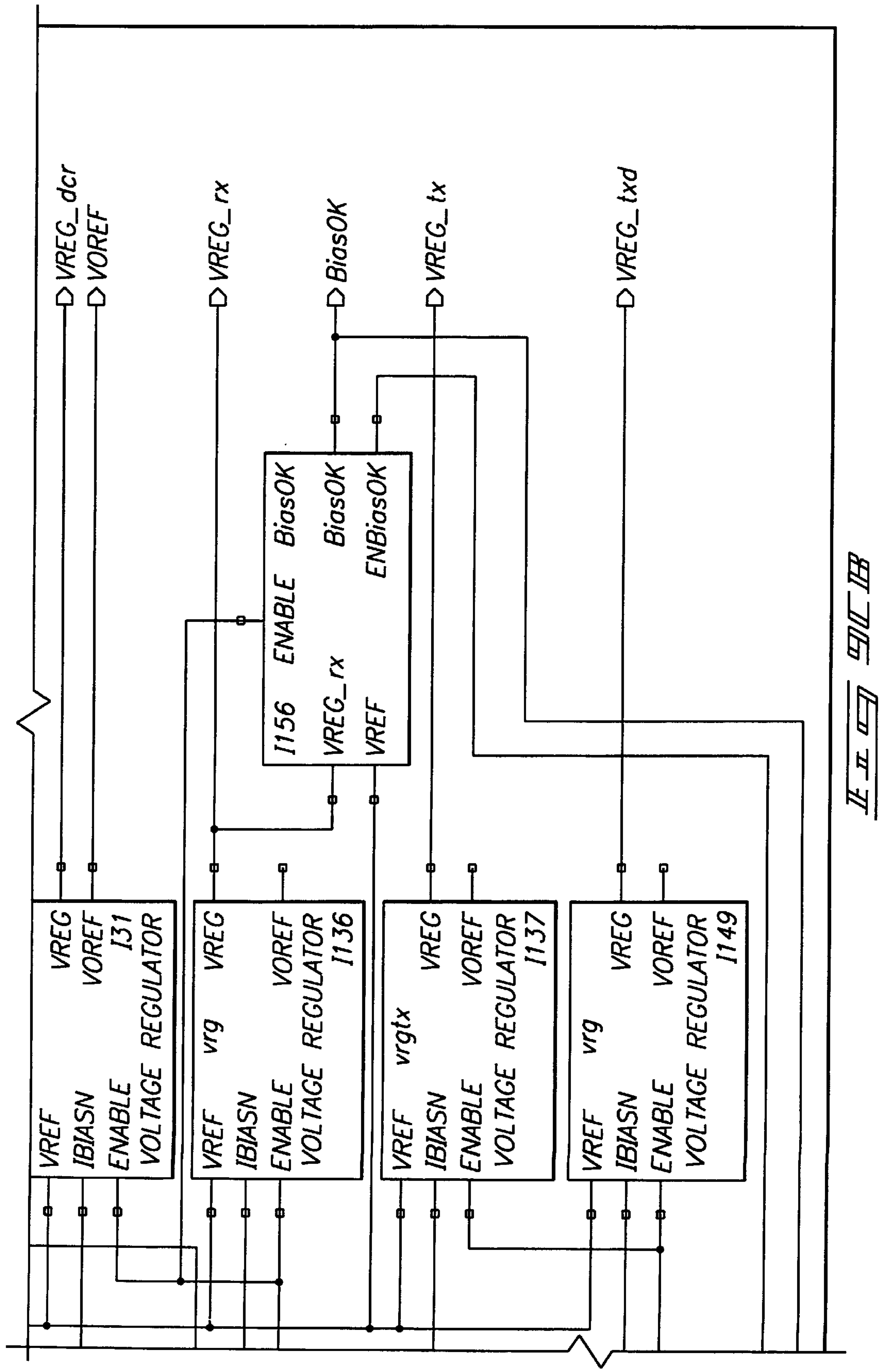

FIG. 9 is a graph illustrating how FIGS. 9AA–CB are to be assembled. After such assembly, FIGS. 9AA–CB provide a circuit drawing of an analog processor “anlgproc” included in the circuit of FIGS. 6AA–EK.

FIG. 9.01 is a graph illustrating how FIGS. 9.01AA–DH are to be assembled. After such assembly, FIGS. 9.01AA–DH provide a circuit drawing of an algorithmic A/D converter with databus interface “ada_new” included in the circuit of FIGS. 9AA–CB.

FIG. 9.0101 is a graph illustrating how FIGS. 9.0101AA–CK are to be assembled. After such assembly, FIGS. 9.0101AA–CK provide a circuit drawing of a differential I/O op-amp “dopamp” included in the circuit of FIGS. 9.01AA–DH.

FIG. 9.0102 provides a circuit drawing of an analog divider (divide by two) “adaprescale” included in the circuit of FIGS. 9.01AA–DH.

FIG. 9.0103 is a graph illustrating how FIGS. 9.0103AJ–FP are to be assembled. After such assembly, FIGS. 9.0103AJ–FP provide a circuit drawing of a control PLA “adactl_new” included in the circuit of FIGS. 9.01AA–DH.

FIG. 9.010301 is a graph illustrating how FIGS. 9.010301AA–CC are to be assembled. After such assembly, FIGS. 9.010301AA–CC provide a circuit drawing of a clock generator “adacgen_new” included in the circuit of FIGS. 9.0103AJ–FP.

FIG. 9.010302 is a graph illustrating how FIGS. 9.010302AA–AB are to be assembled. After such assembly, FIGS. 9.010302AA–AB provide a circuit drawing of a control output driver "adacdrv__new" included in the circuit of FIGS. 9.0103AJ–FP.

FIG. 9.010303 is a graph illustrating how FIGS. 9.010303AA–AB are to be assembled. After such assembly, FIGS. 9.010303AA–AB provide a circuit drawing of a control output driver "adacdrvn__new" included in the circuit of FIGS. 9.0103AJ–FP.

FIG. 9.010304 is a graph illustrating how FIGS. 9.010304AA–BB are to be assembled. After such assembly, FIGS. 9.010304AA–BB provide a circuit drawing of a data latch "adadlat__new" included in the circuit of FIGS. 9.0103AJ–FP.

FIG. 9.0104 is a graph illustrating how FIGS. 9.0104AA–DD are to be assembled. After such assembly, FIGS. 9.0104AA–DD provide a circuit drawing of an analog bias circuit "adabias__new" included in the circuit of FIGS. 9.01AA–DH. FIG. 9.02 is a graph illustrating how FIGS. 9.02AA–DK are to be assembled. After such assembly, FIGS. 9.02AA–DK provide a circuit drawing of a Vdd power up detector "pup" included in the circuit of FIGS. 9AA–CB.

FIG. 9.03 is a graph illustrating how FIGS. 9.03AA–BB are to be assembled. After such assembly, FIGS. 9.03AA–BB provide a circuit drawing of a master bias source "mbs" included in the circuit of FIGS. 9AA–CB.

FIG. 9.03Q1 is a graph illustrating how FIGS. 9.0301AA–DJ are to be assembled. After such assembly, FIGS. 9.0301AA–DJ provide a circuit drawing of a band gap reference generator "mbs__bgr" included in the circuit of FIGS. 9.03AA–BB.

FIG. 9.0302 is a graph illustrating how FIGS. 9.0302AA–DI are to be assembled. After such assembly, FIGS. 9.0302AA–DI provide a circuit drawing of a temperature compensated current generator "mbs__cur" included in the circuit of FIGS. 9.03AA–BB.

FIG. 9.0303 is a graph illustrating how FIGS. 9.0303AA–CF are to be assembled. After such assembly, FIGS. 9.0303AA–CF provide a circuit drawing of a reference current generator "mbs__iref" included in the circuit of FIGS. 9.03AA–BB.

FIG. 9.04 is a graph illustrating how FIGS. 9.04AA–CE are to be assembled. After such assembly, FIGS. 9.04AA–CE provide a circuit drawing of a voltage regulator "vrg" included in the circuit of FIGS. 9AA–CB.

FIG. 9.05 is a graph illustrating how FIGS. 9.05AA–FE are to be assembled. After such assembly, FIGS. 9.05AA–FE provide a circuit drawing of a voltage regulator "vrgtx" included in the circuit of FIGS. 9AA–CB.

FIG. 9.0501 is a graph illustrating how FIGS. 9.0501AA–CD are to be assembled. After such assembly, FIGS. 9.0501AA–CD provide a circuit drawing of an operational amplifier without compensation "opampnc" included in the circuit of FIGS. 9.05AA–FE.

FIG. 9.06 is a graph illustrating how FIGS. 9.06AA–DD are to be assembled. After such assembly, FIGS. 9.06AA–DD provide a circuit drawing of a bias OK detector "biasok" included in the circuit of FIGS. 9AA–CB.

FIG. 9.07 is a graph illustrating how FIGS. 9.07AA–EG are to be assembled. After such assembly, FIGS. 9.07AA–EG provide a circuit drawing of an analog port current source "aportcs" included in the circuit of FIGS. 9AA–CB.

FIG. 9.08 is a graph illustrating how FIGS. 9.08AA–CC are to be assembled. After such assembly, FIGS. 9.08AA–CC provide a circuit drawing of an analog multiplexer decoder "asl" included in the circuit of FIGS. 9AA–CB.

FIG. 9.09 is a graph illustrating how FIGS. 9.09AA–BB are to be assembled. After such assembly, FIGS. 9.09AA–BB provide a circuit drawing of a random clock generator "rcg" included in the circuit of FIGS. 9AA–CB.

FIG. 9.0901 is a graph illustrating how FIGS. 9.0901AA–CH are to be assembled. After such assembly, FIGS. 9.0901AA–CH provide a circuit drawing of a linear feedback shift register "rcg__sreg" included in the circuit of FIGS. 9.09AA–CB.

FIG. 9.090101 is a graph illustrating how FIGS. 9.090101AA–CC are to be assembled. After such assembly, FIGS. 9.090101AA–CC provide a circuit drawing of a shift register bit "rcg__sregbit0" included in the circuit of FIGS. 9.0901AA–CH.

FIG. 9.090102 is a graph illustrating how FIGS. 9.090102AA–BB are to be assembled. After such assembly, FIGS. 9.090102AA–BB provide a circuit drawing of a shift register bit "rcg__sregbit" included in the circuit of FIGS. 9.0901AA–CH.

FIG. 9.0902 is a graph illustrating how FIGS. 9.0902AA–FL are to be assembled. After such assembly, FIGS. 9.0902AA–FL provide a circuit drawing of a low power oscillator and bias generator "rcg__osc" included in the circuit of FIGS. 9.09AA–CB.

FIG. 9.0903 is a graph illustrating how FIGS. 9.0903AA–CC are to be assembled. After such assembly, FIGS. 9.0903AA–CC provide a circuit drawing of a clock generator "rcg__clkgen" included in the circuit of FIGS. 9.09AA–CB.

Figure 10A:
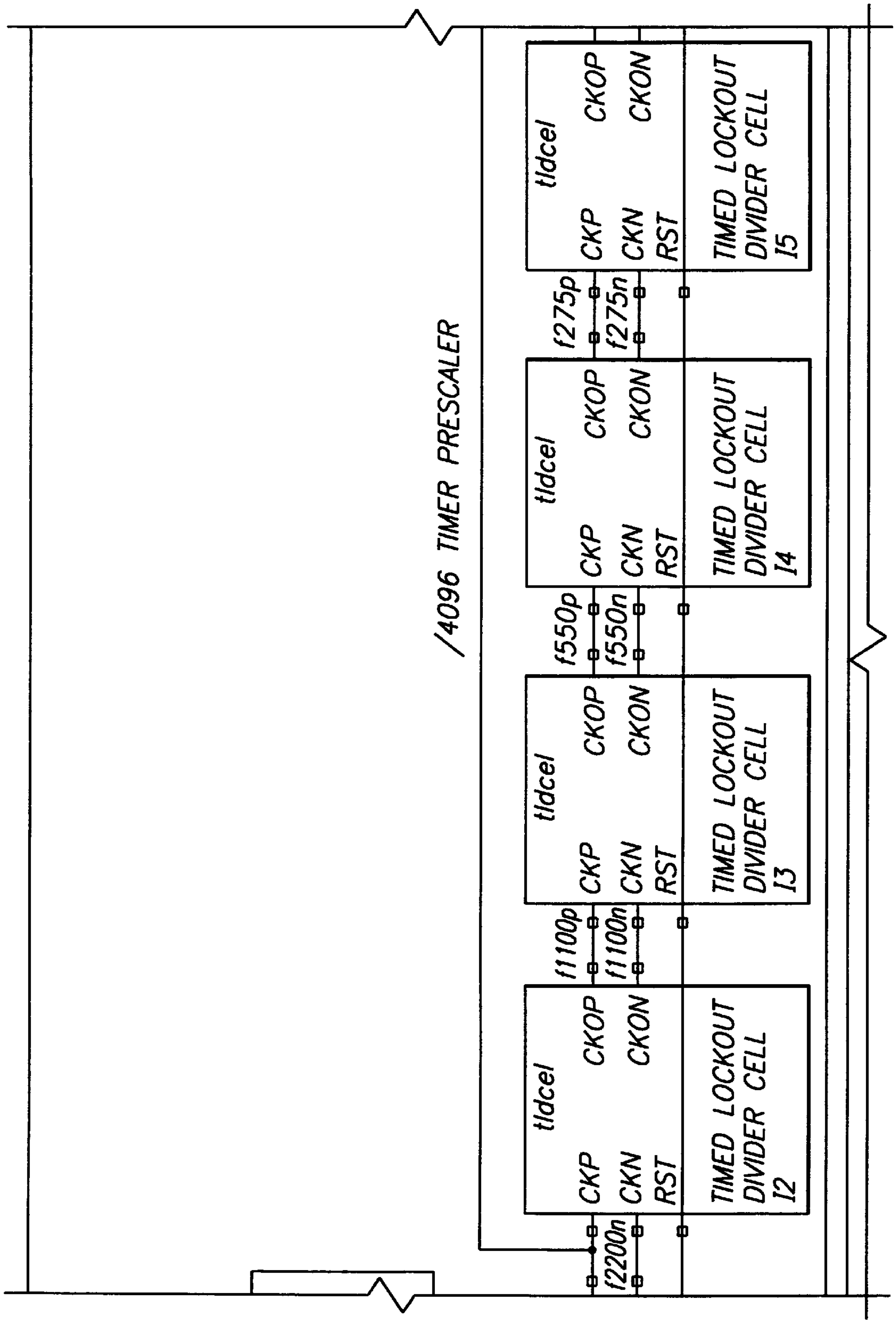
Figure 110B:
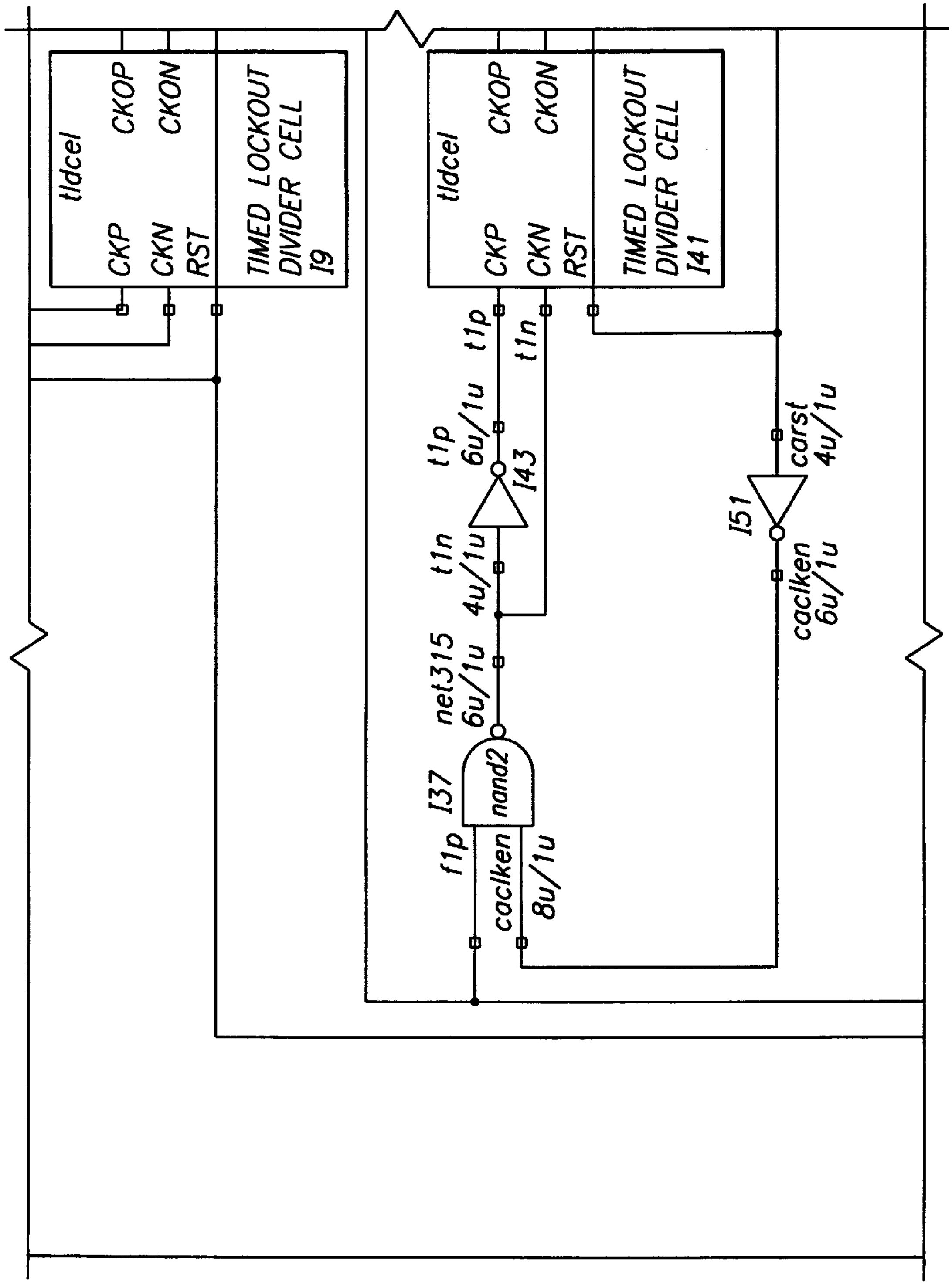
Figure 15C:
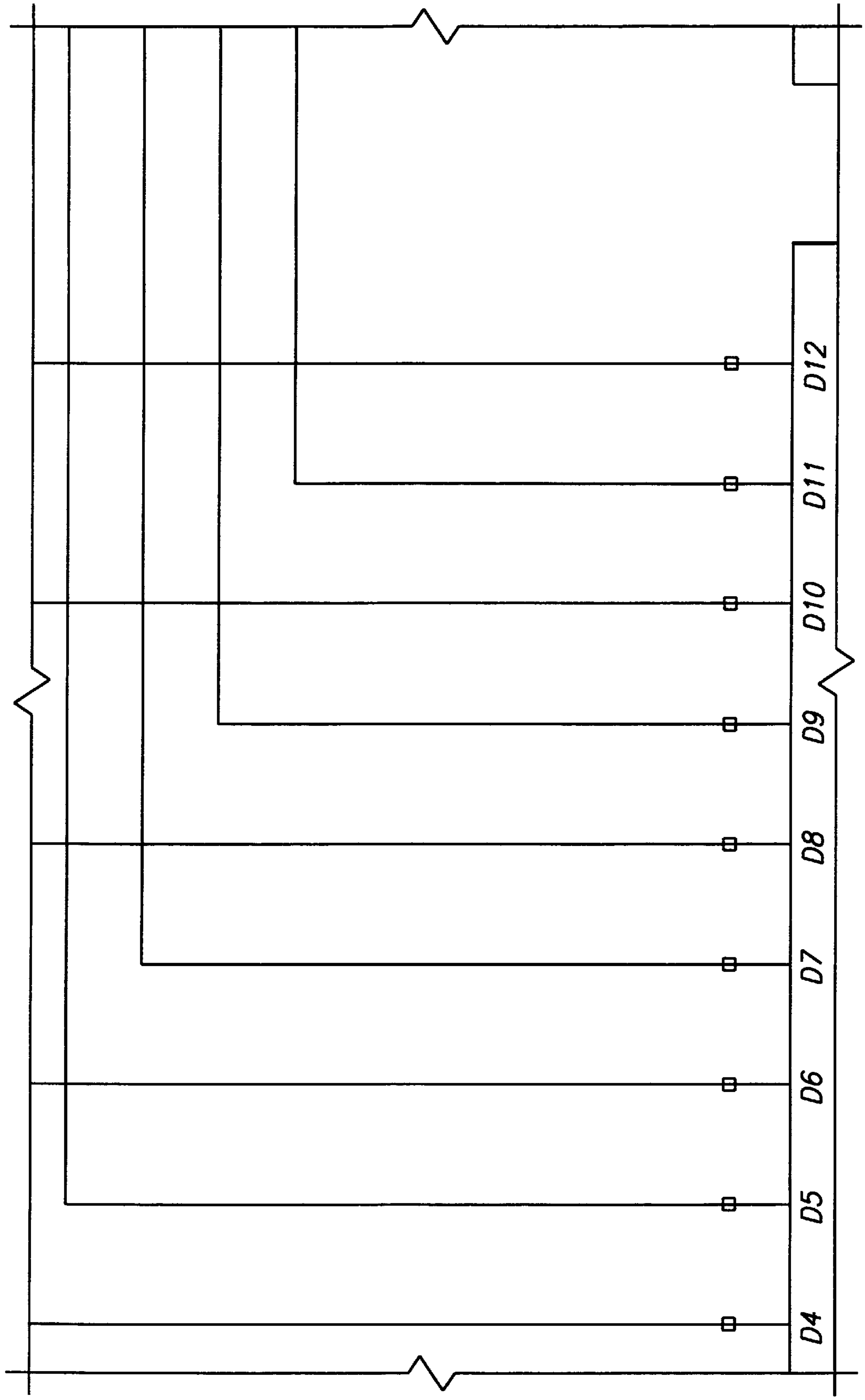
Figure 150B:
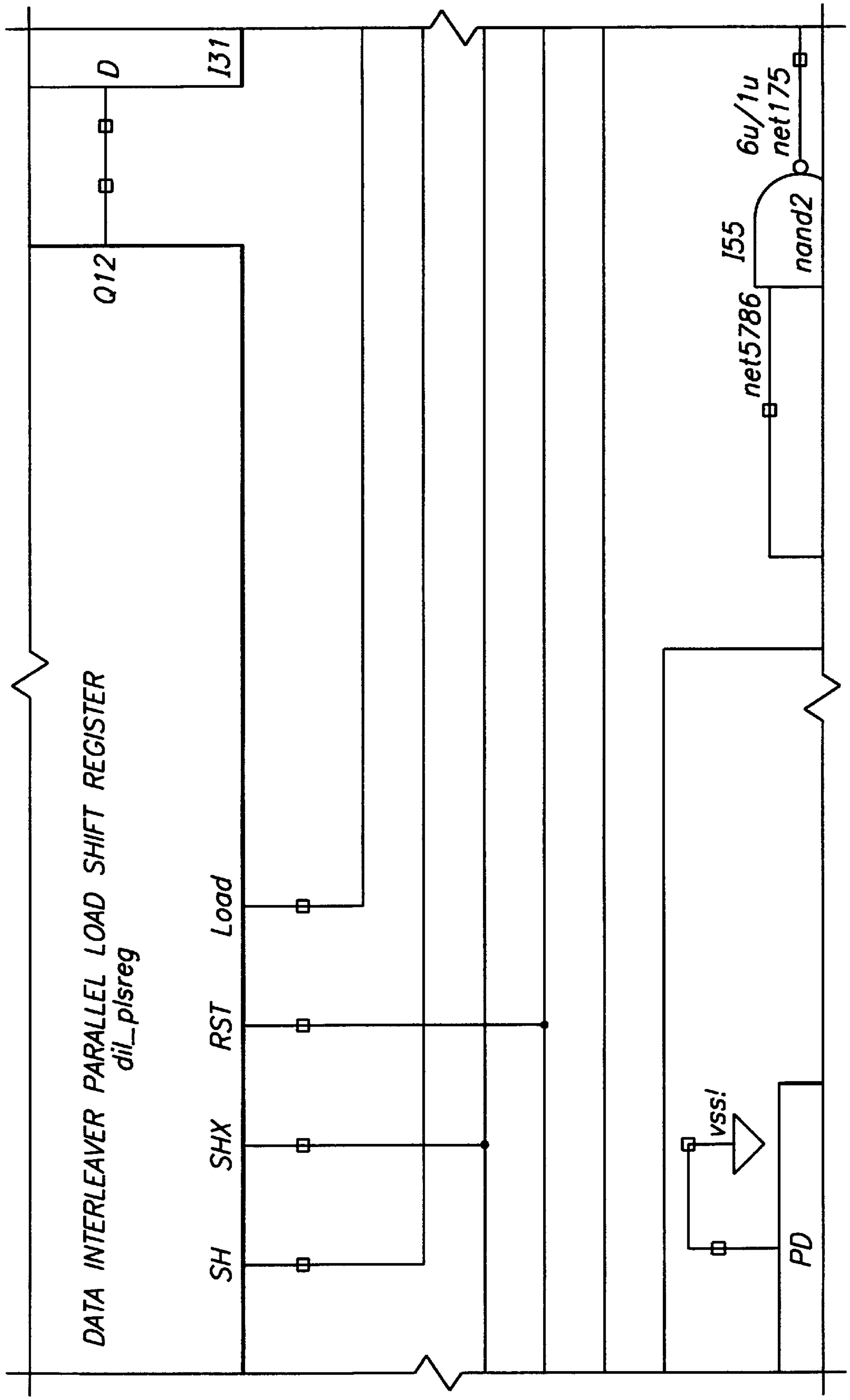
Figure 10:
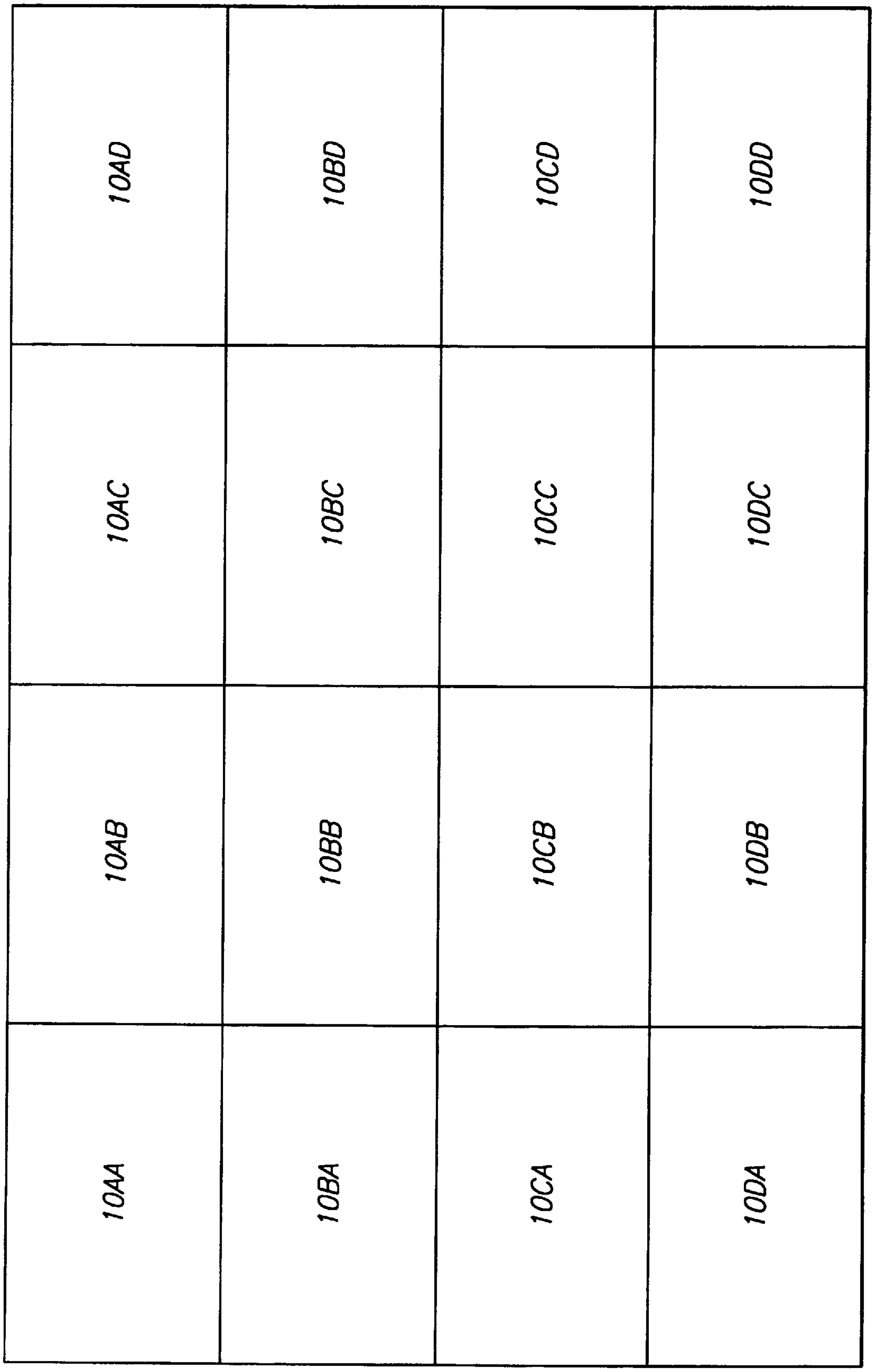
Figure 10A:
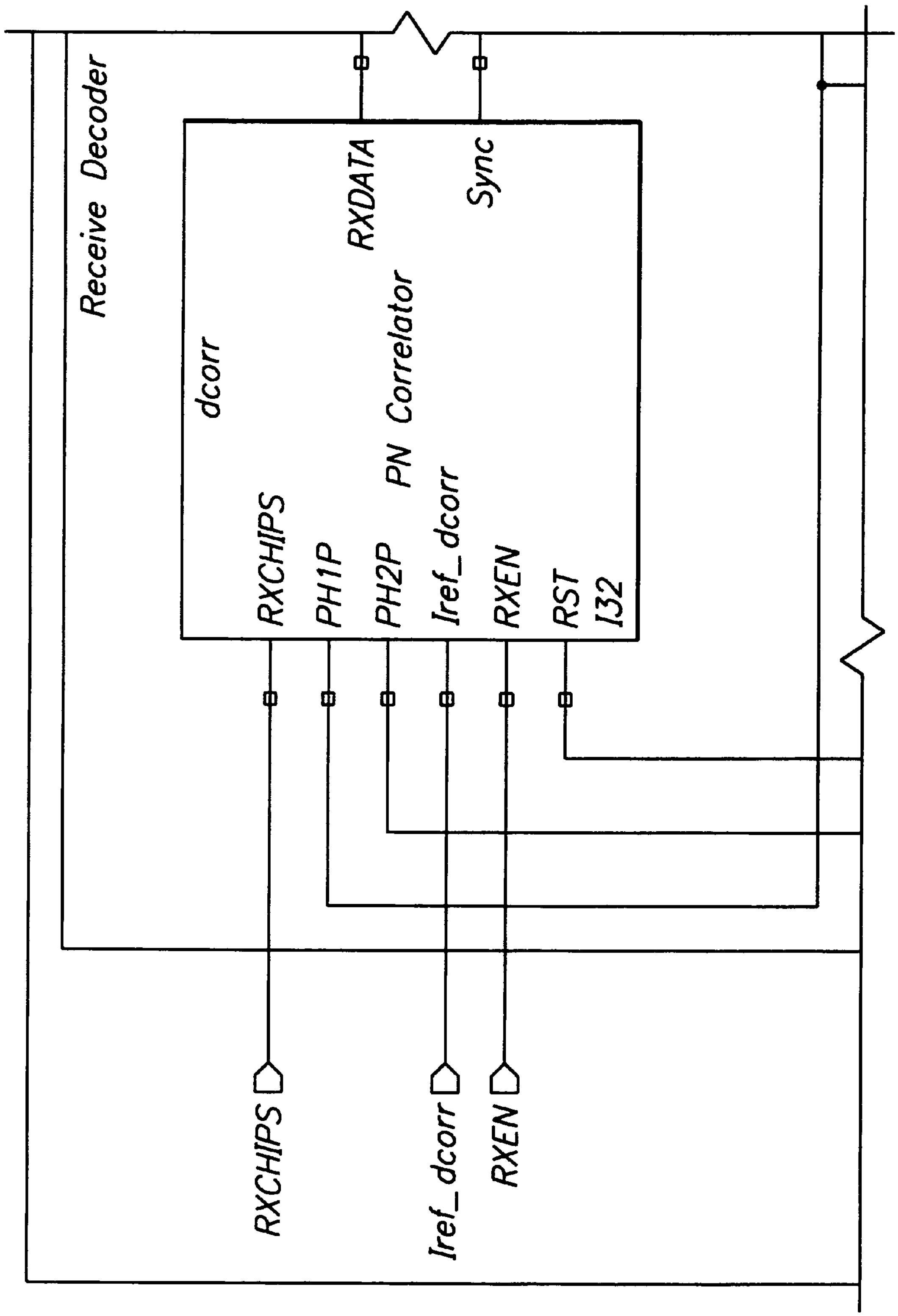
Figure 10A:
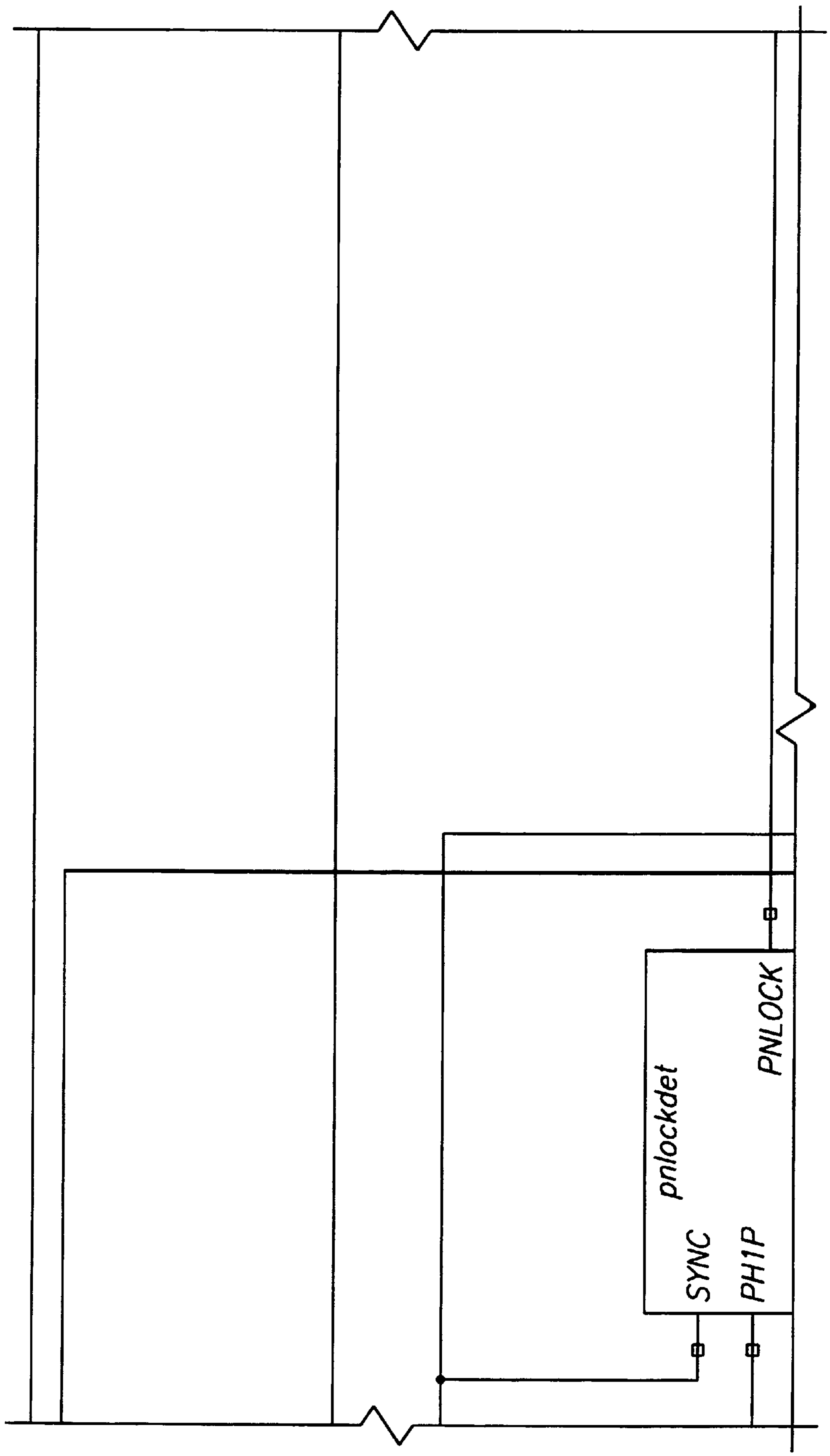
Figure 10A:
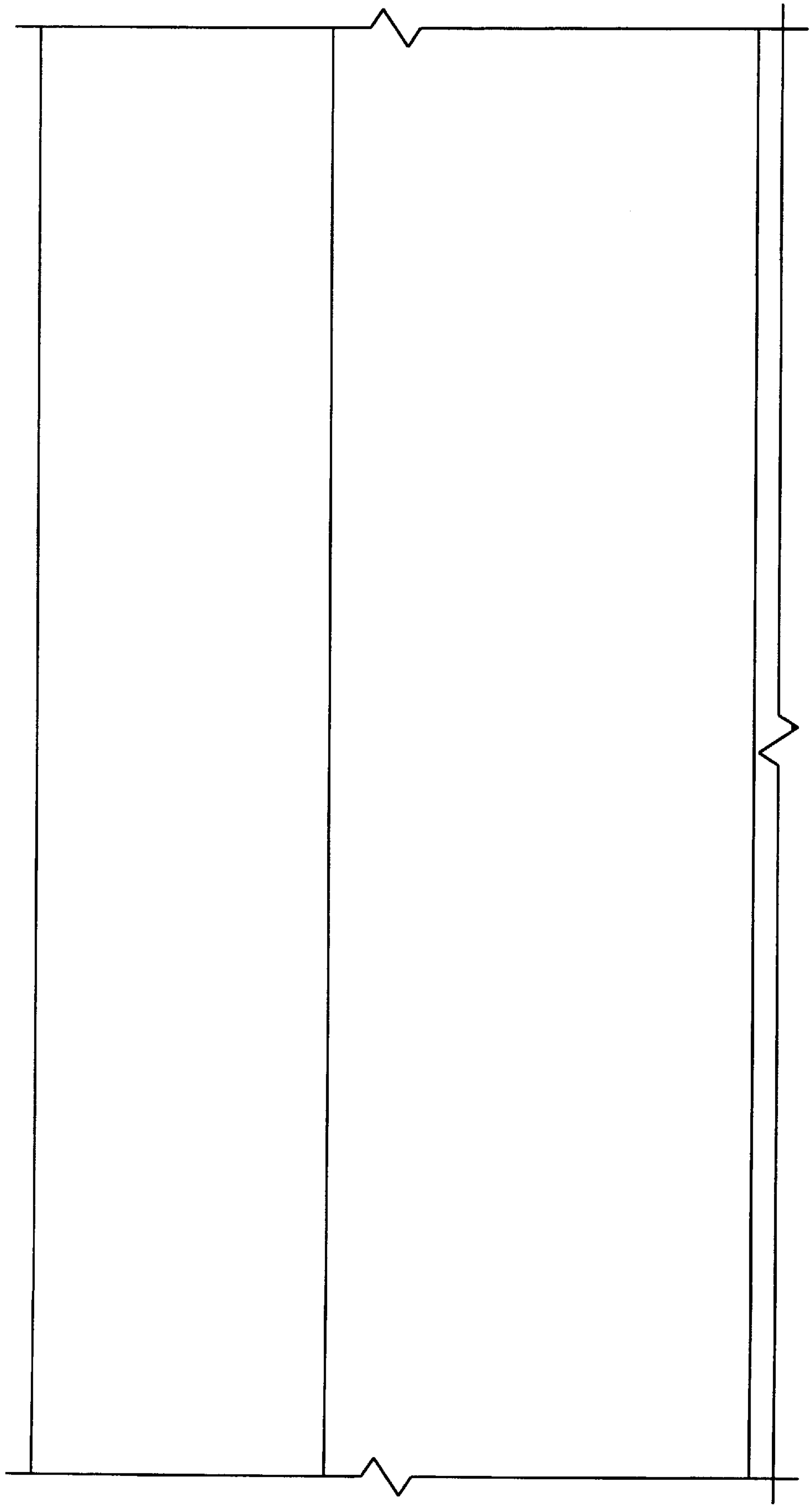
Figure 10A:
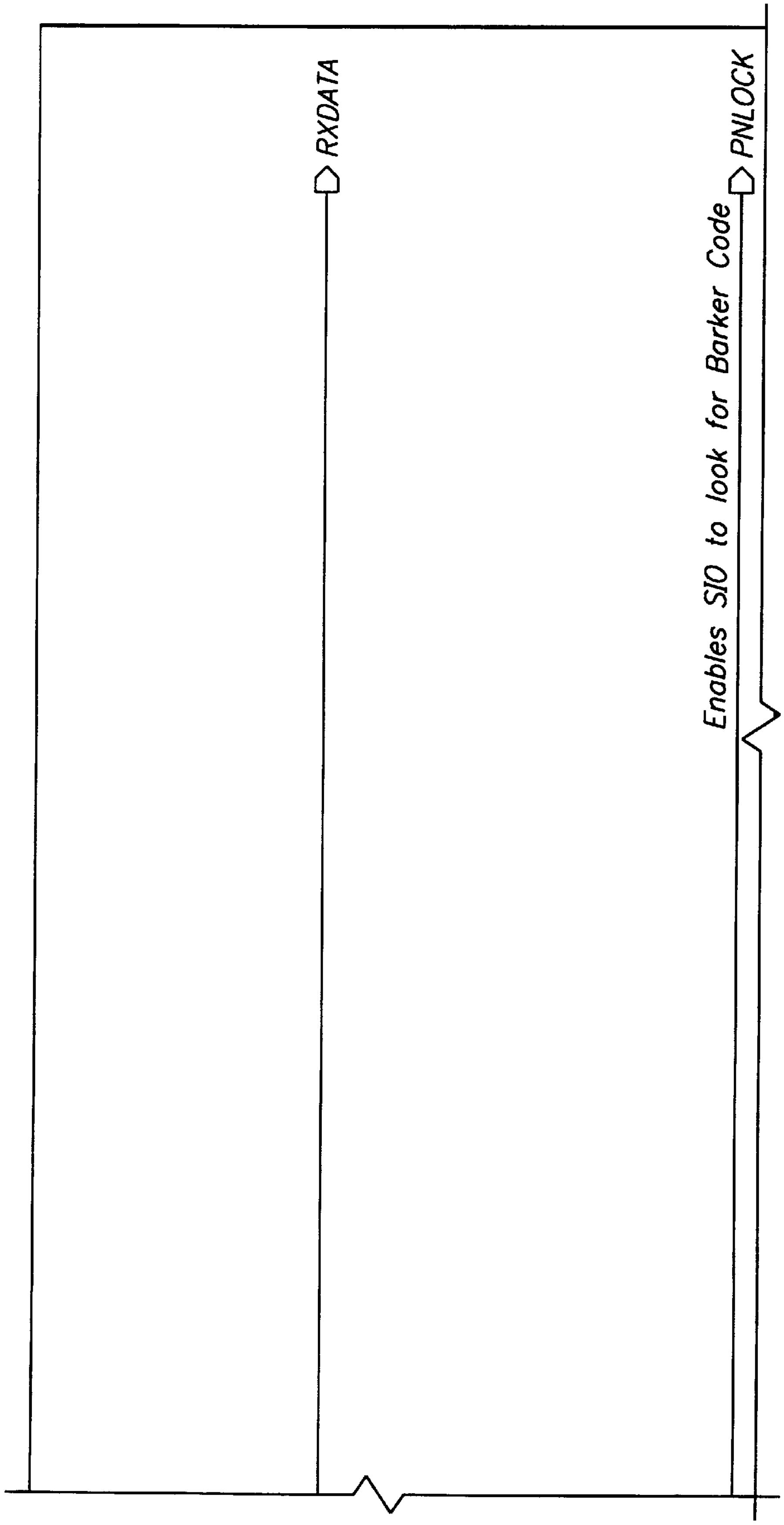
Figure 108A:
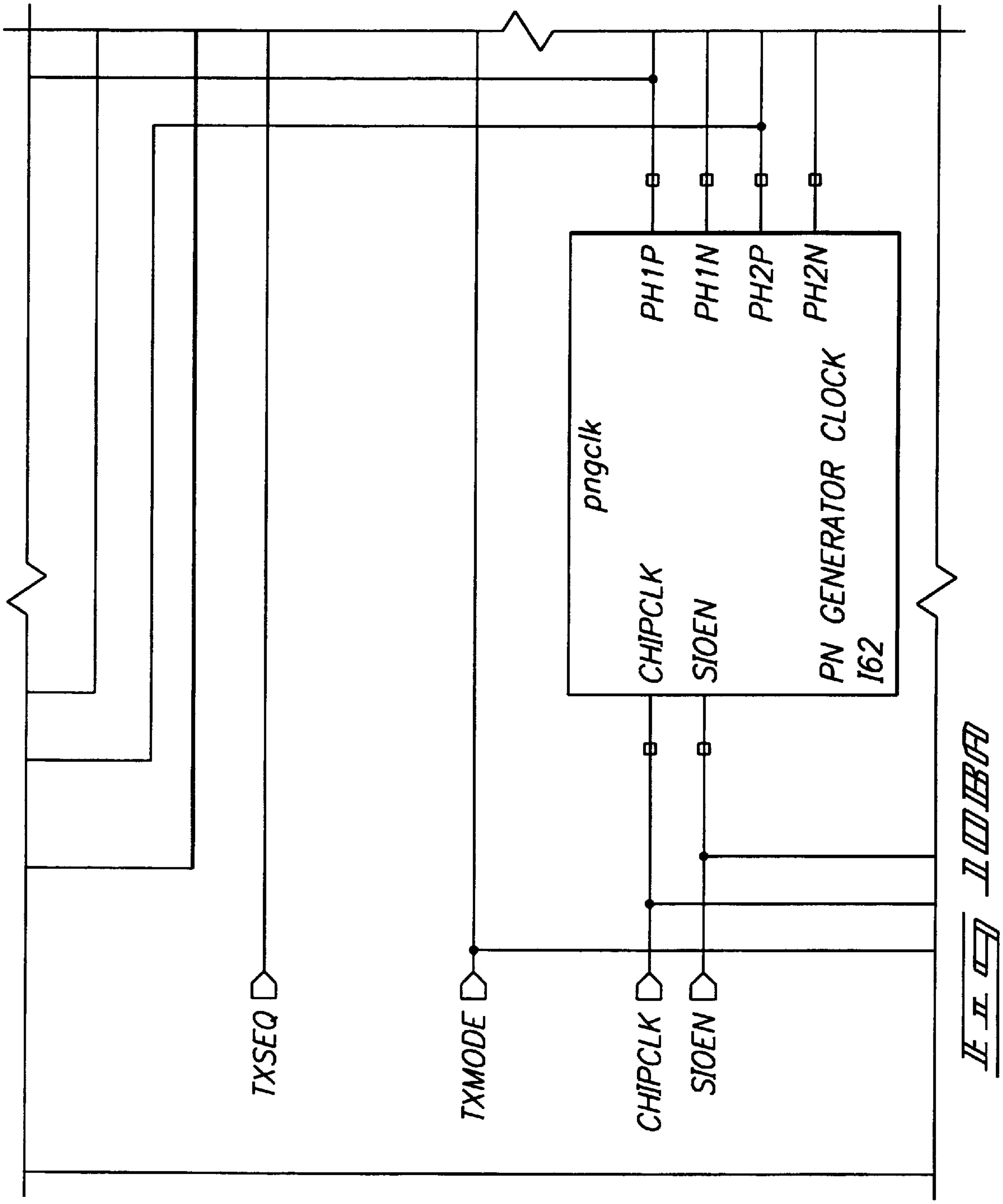
Figure 10B:
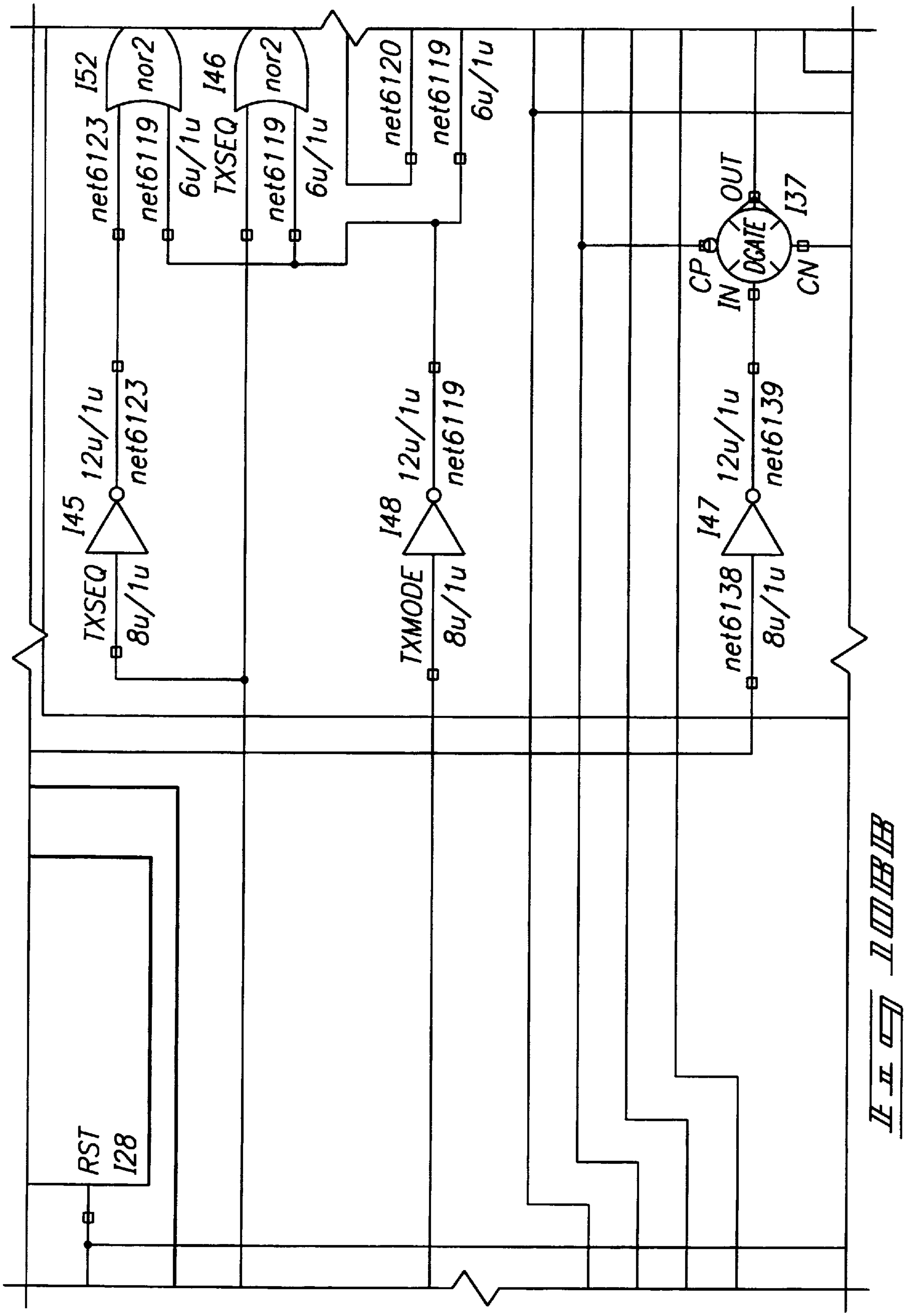
Figure 10B:
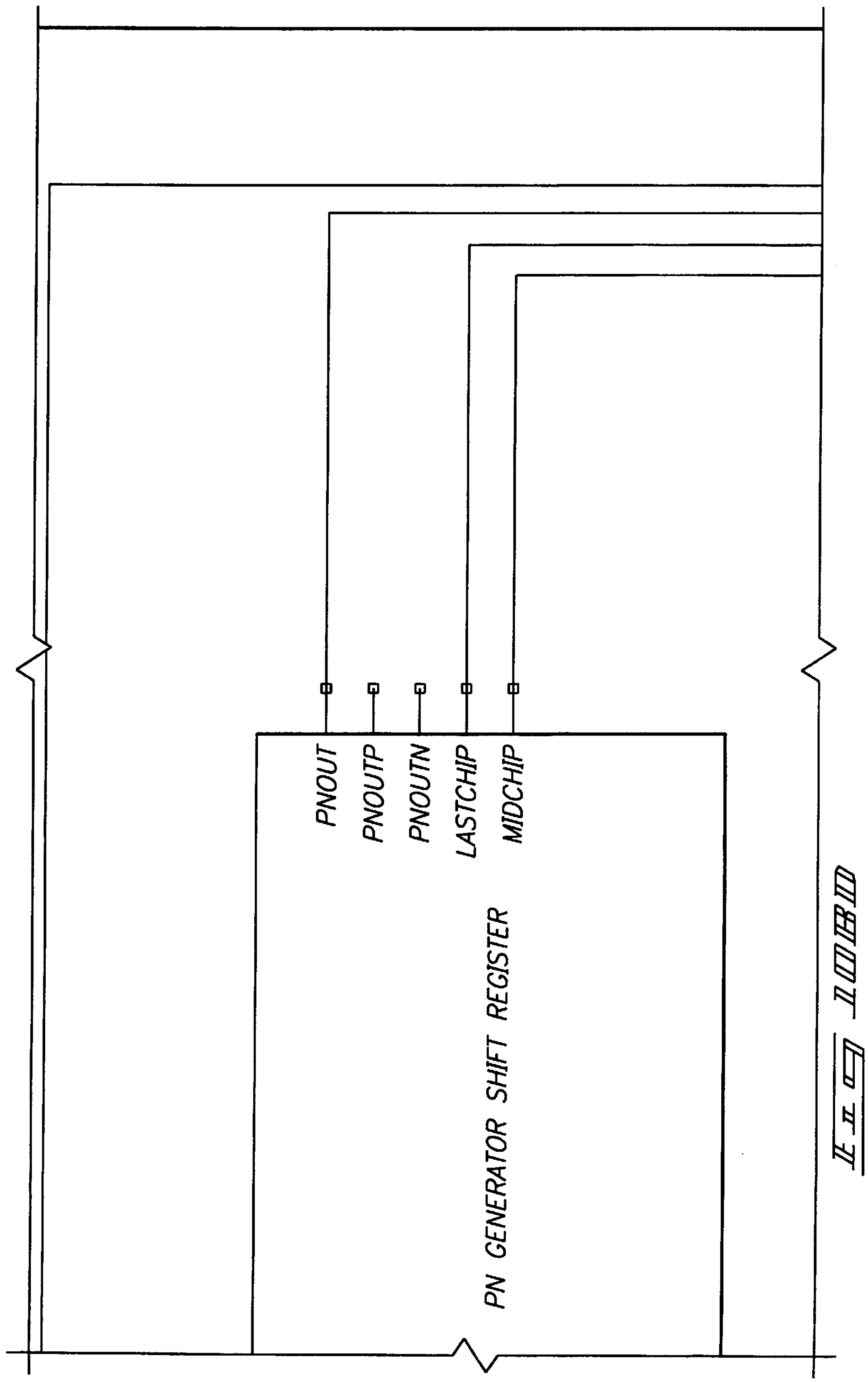
Figure 10C:
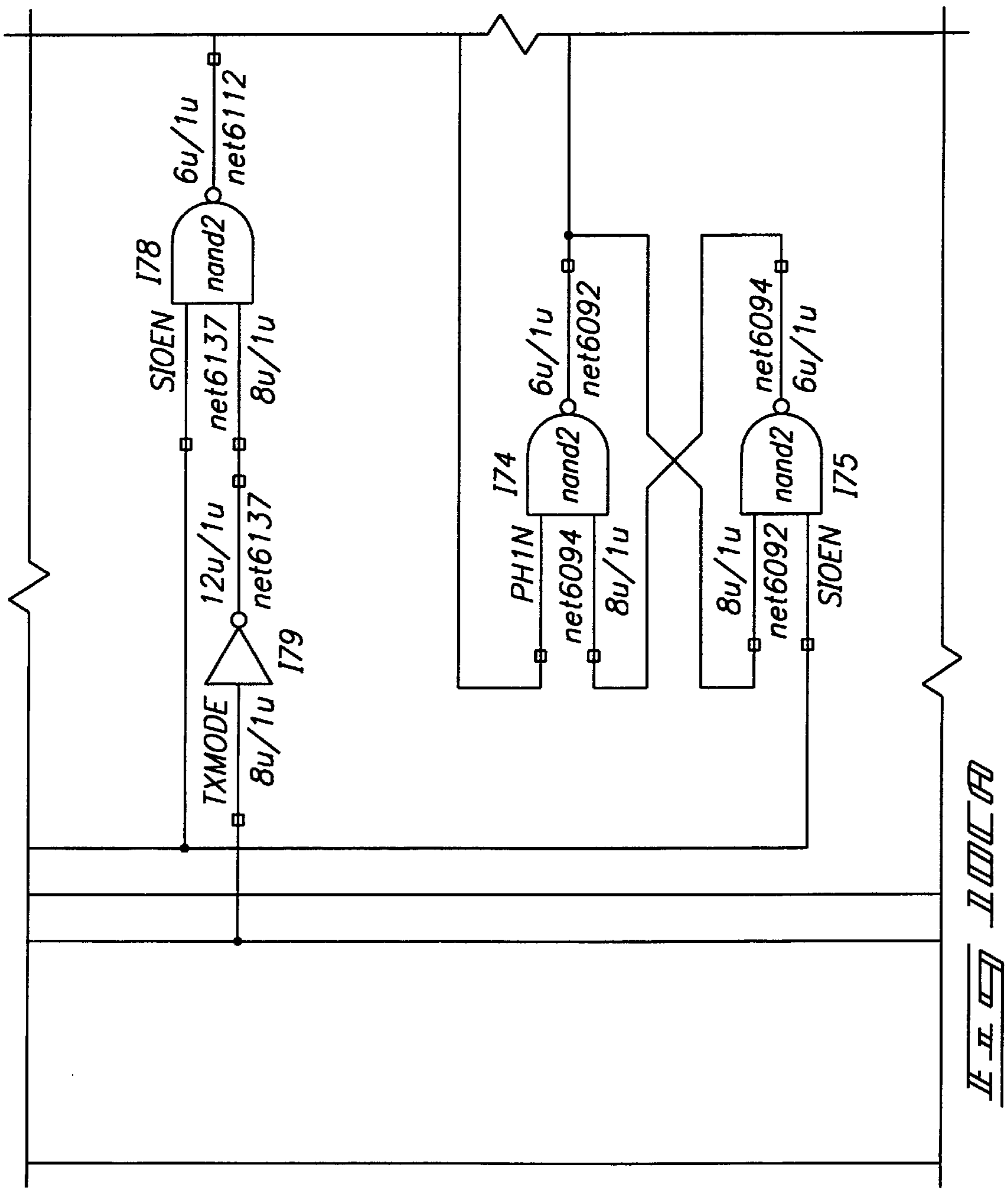
Figure 10C:
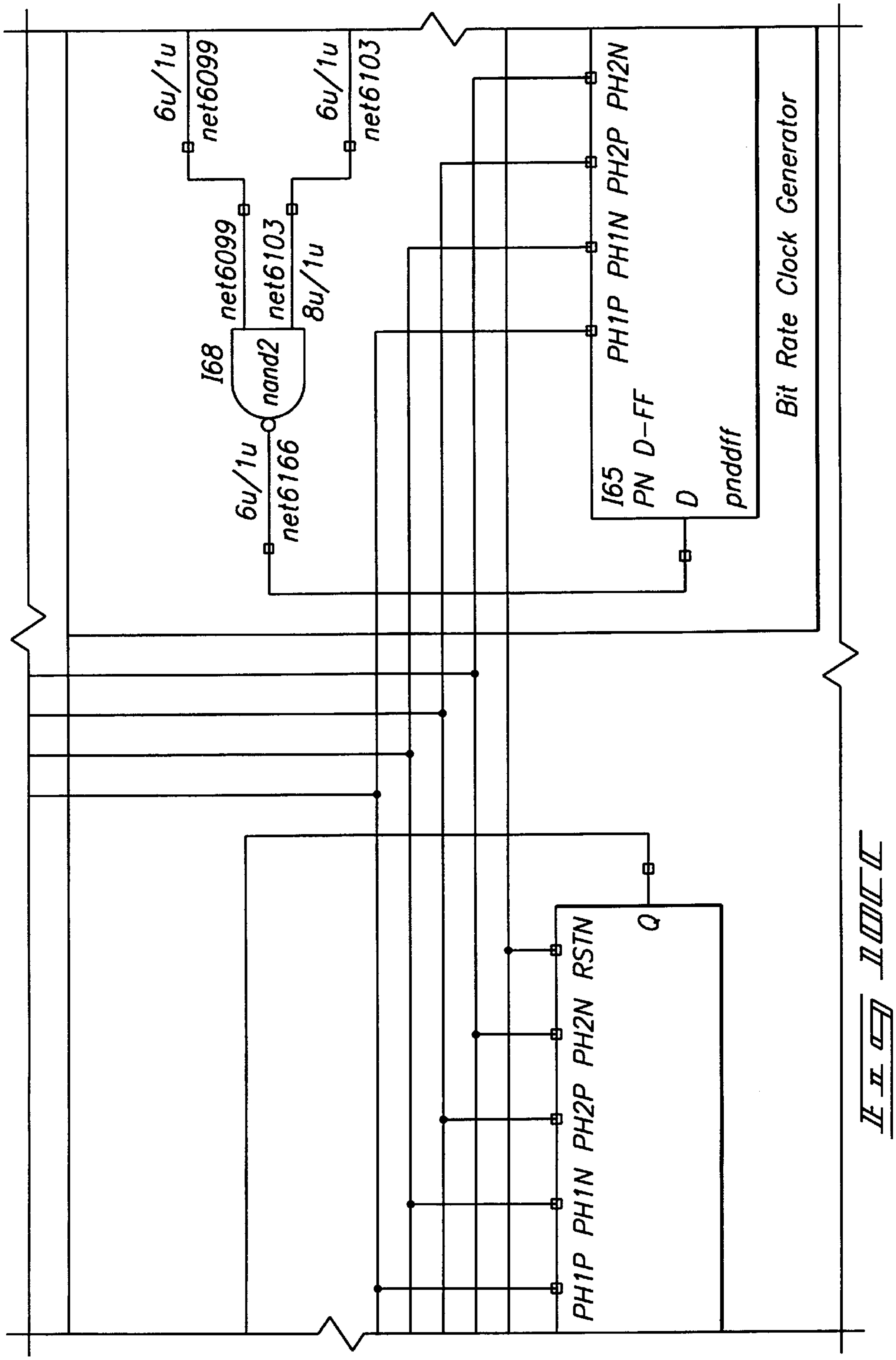
Figure 10C:
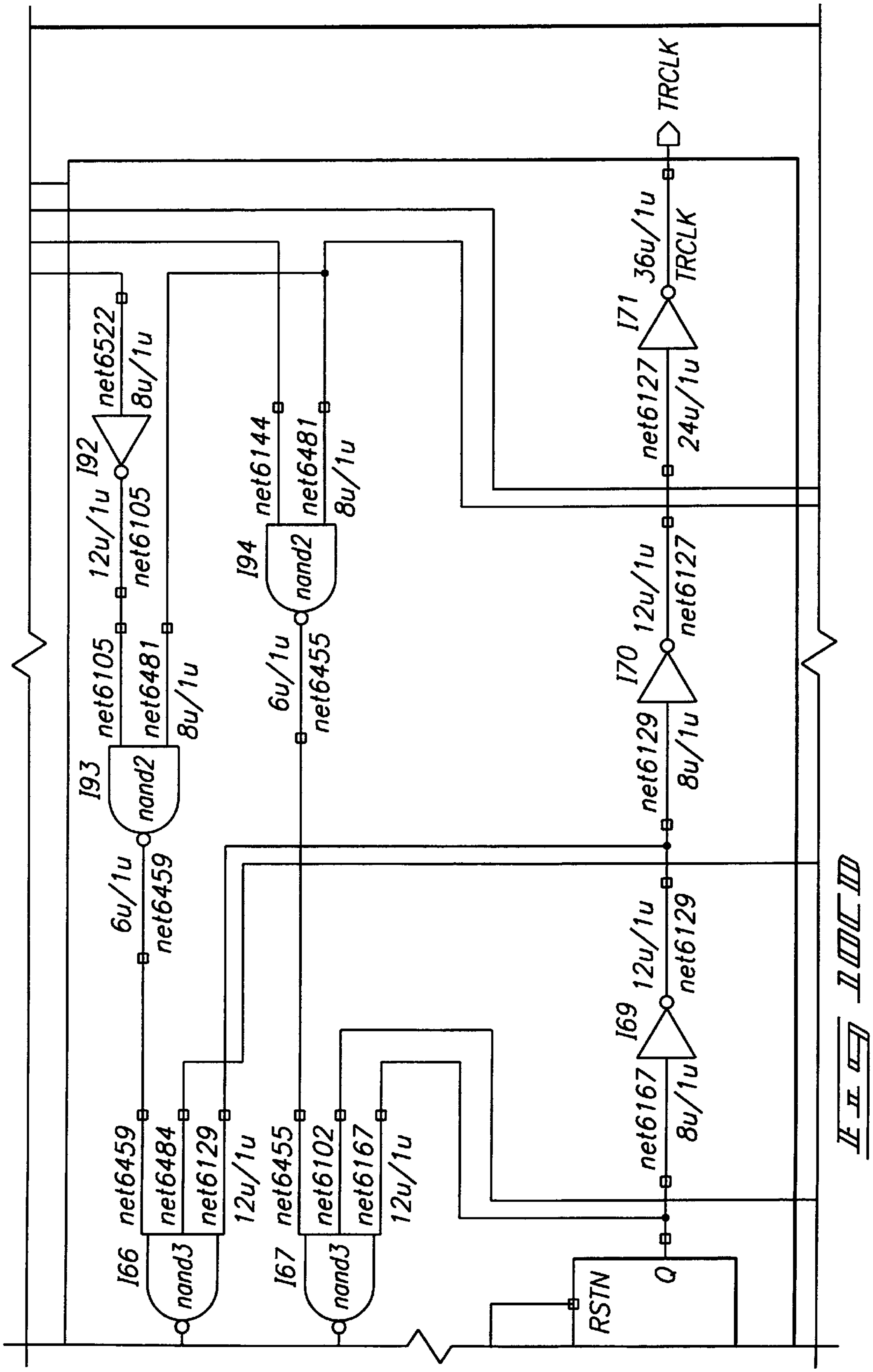
Figure 100A:
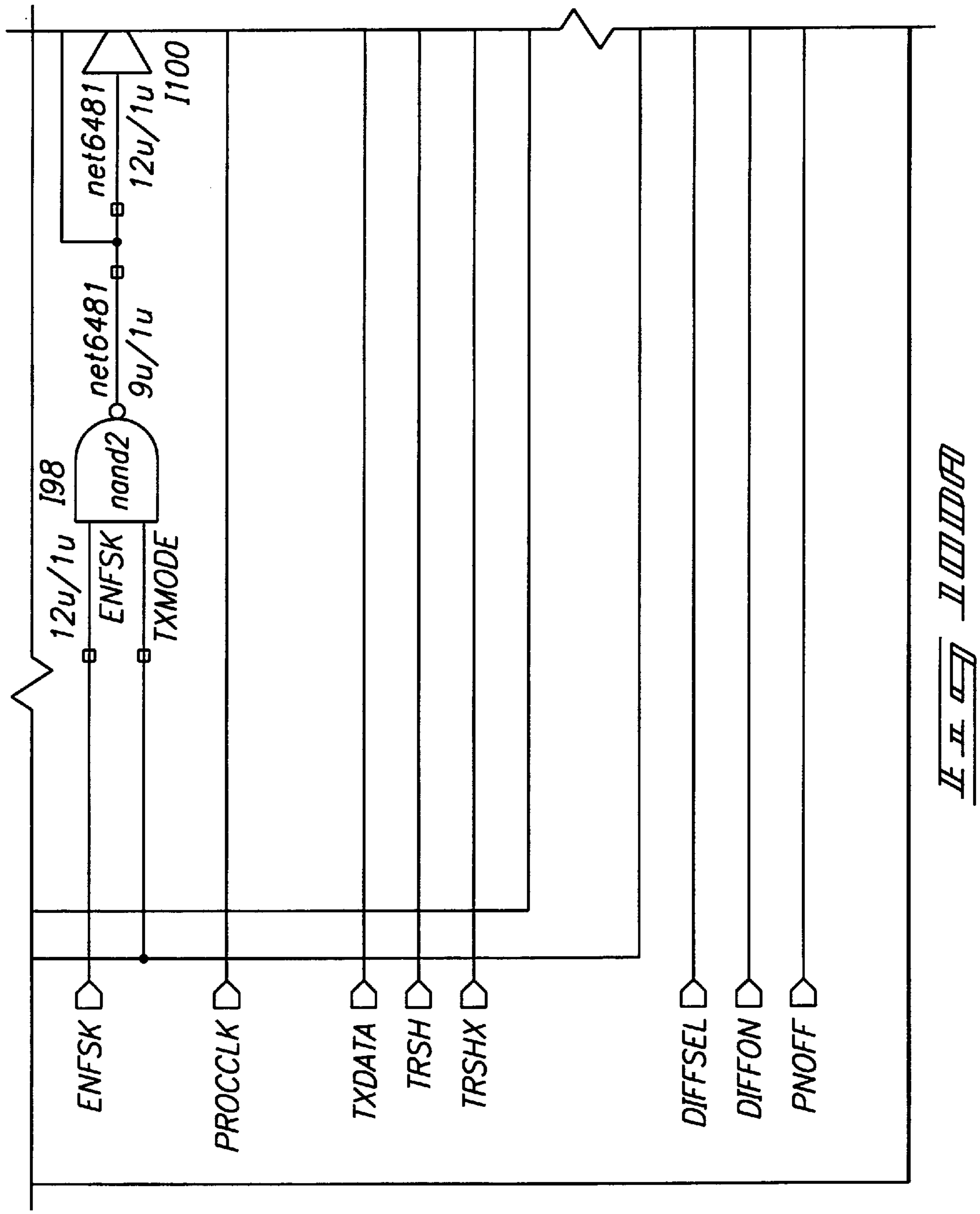
Figure 100B:
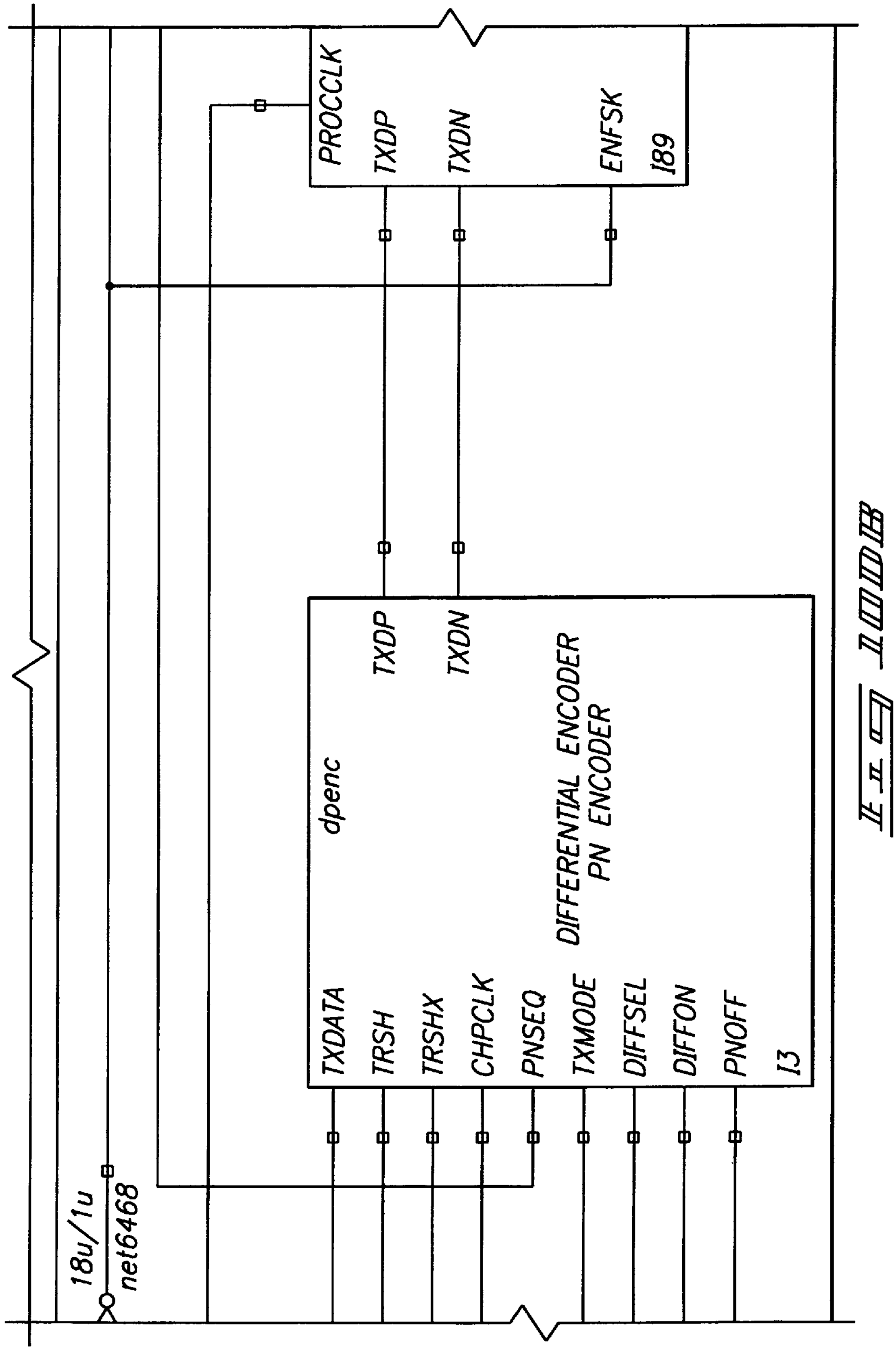
Figure 100D:
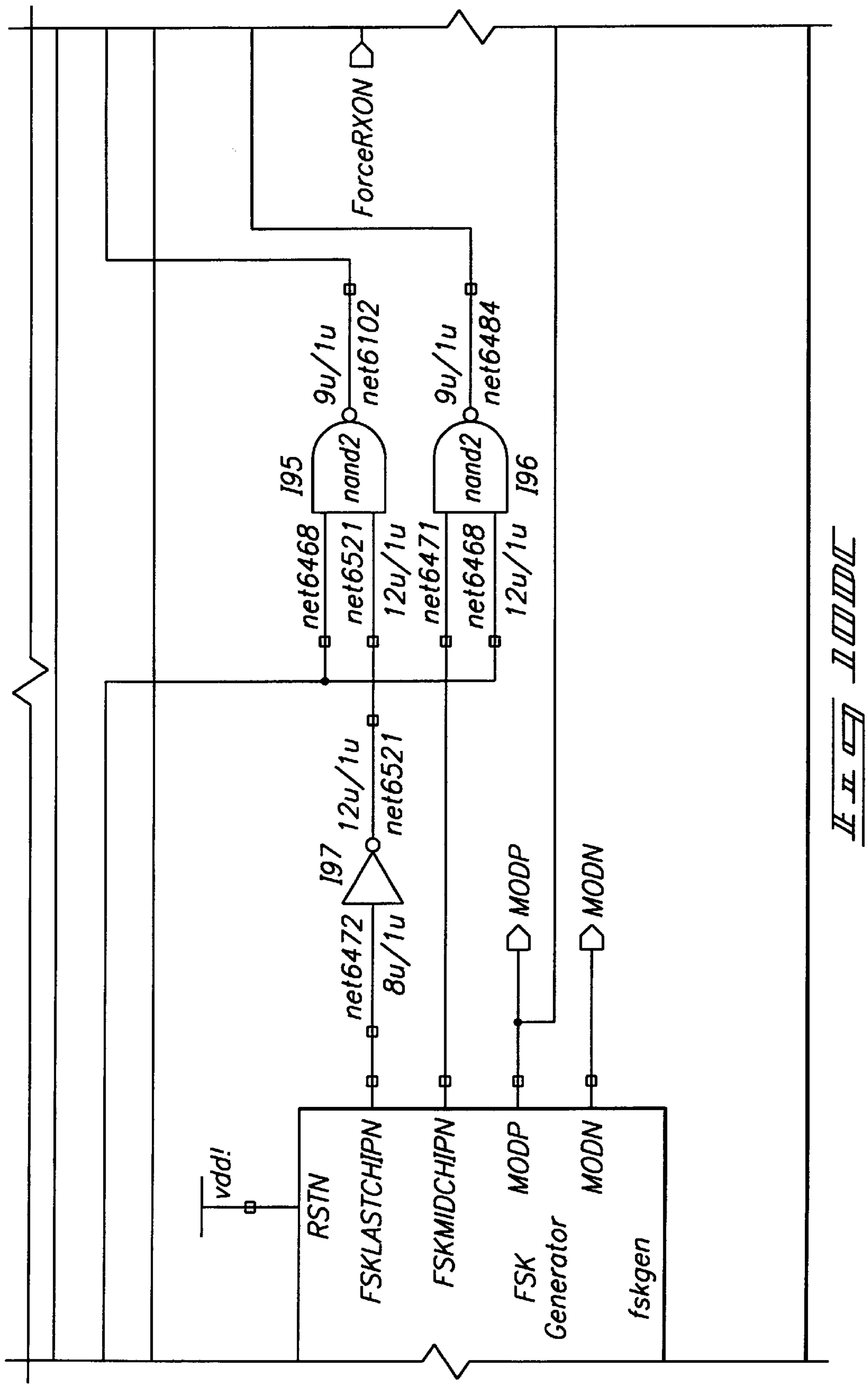
Figure 100D:
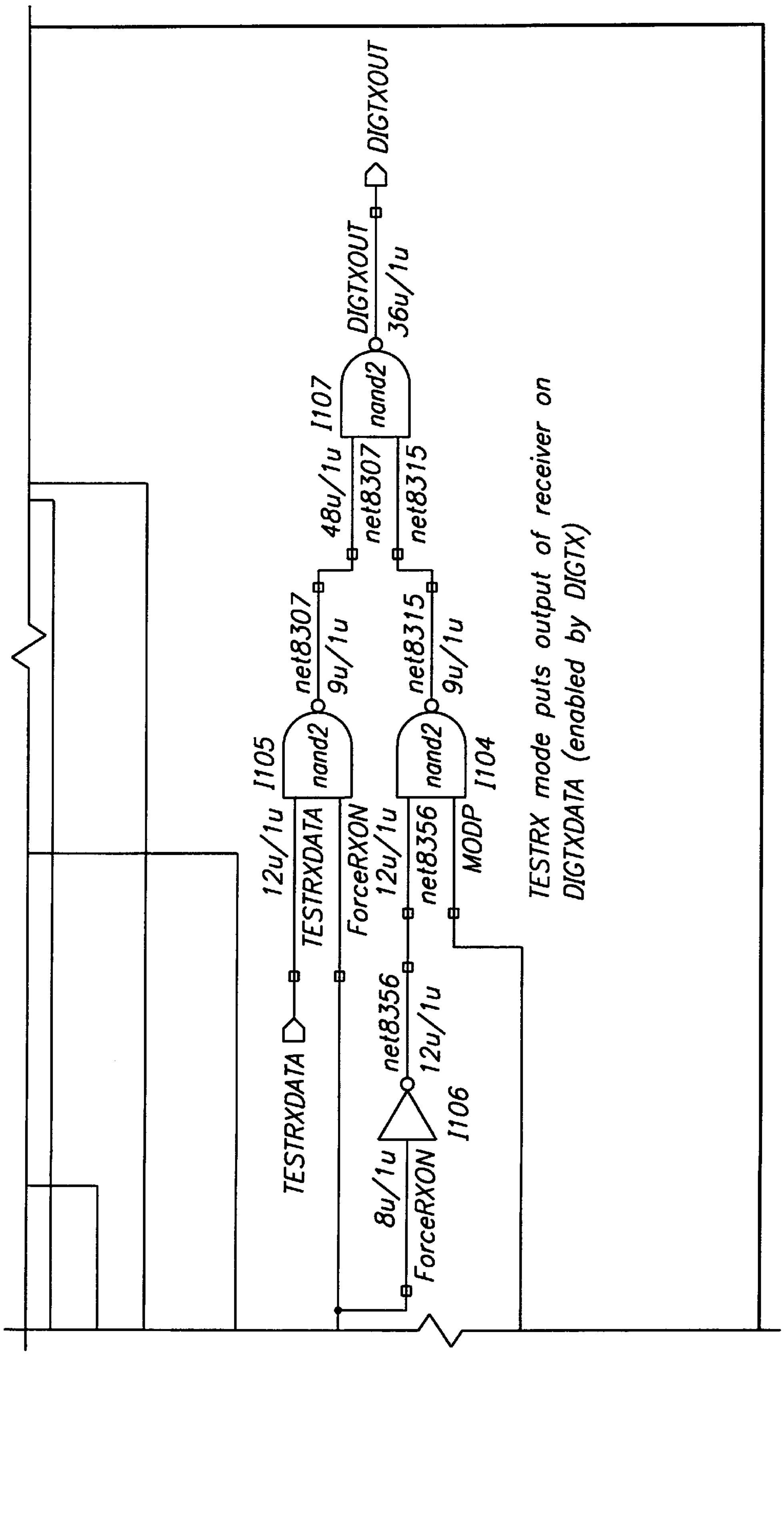
Figure 10:
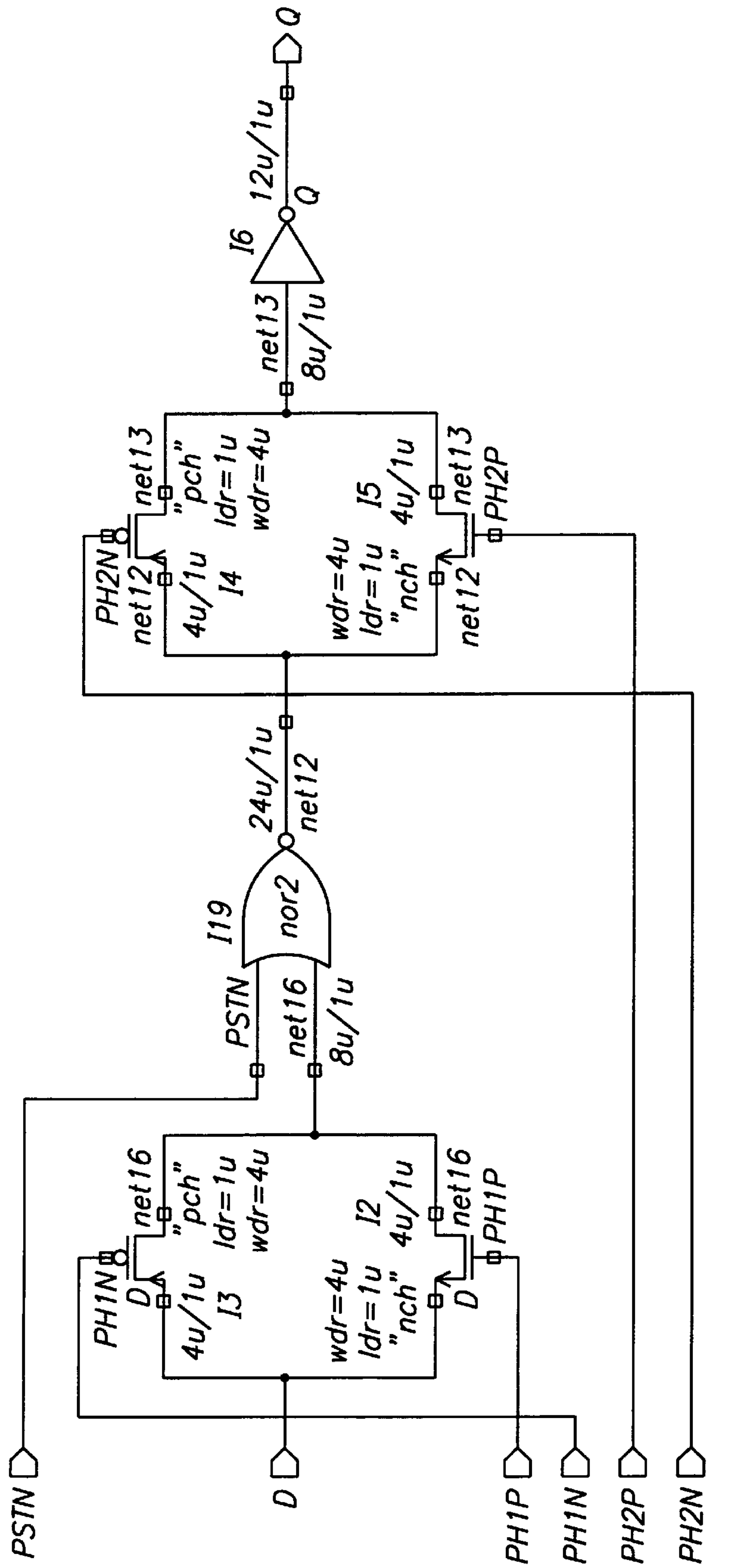
Figure 10:
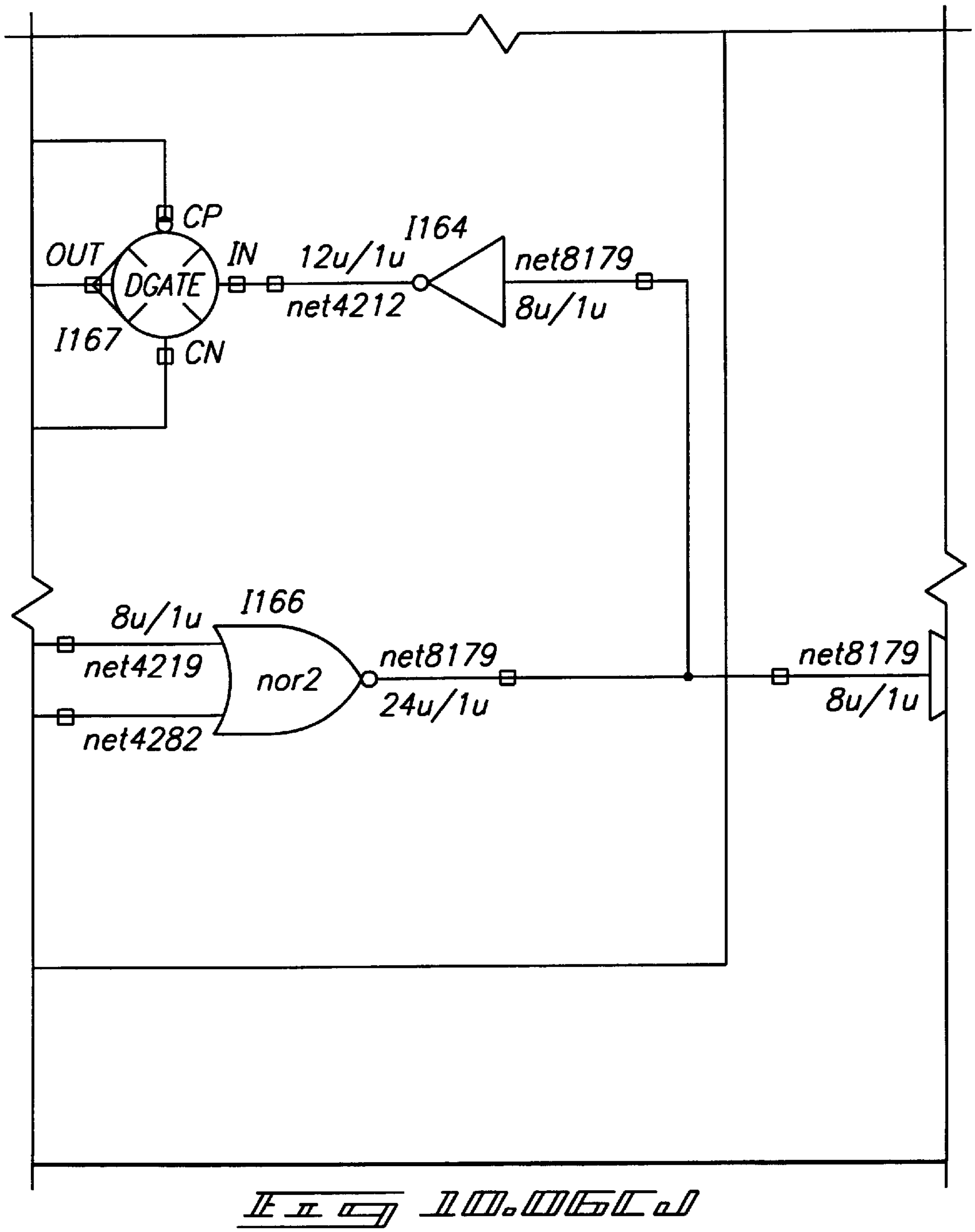

FIG. 10 is a graph illustrating how FIGS. 10AA–DD are to be assembled. After such assembly, FIGS. 10AA–DD provide a circuit drawing of a pn processor "pnproc" included in the circuit of FIGS. 6AA–EK.

FIG. 10.01 is a graph illustrating how FIGS. 10.01AA–DI are to be assembled. After such assembly, FIGS. 10.01AA–DI provide a circuit drawing of a digital PN correlator "dcorr" included in the circuit of FIGS. 10AA–DI.

FIG. 10.0101 is a graph illustrating how FIGS. 10.0101AA–BG are to be assembled. After such assembly, FIGS. 10.001AA–BG provide a circuit drawing of a PN correlator shift register "dcorr__sreg" included in the circuit of FIGS. 10.01AA–DI.

FIG. 10.010101 is a circuit drawing of a PN correlator bit "dcorr__bit" included in the circuit of FIGS. 10.001AA–BG.

FIG. 10.01010101 is a circuit drawing of a shift register cell "dcorr__sregbit" included in the circuit of FIGS. 10.010101.

FIG. 10.0102 is a graph illustrating how FIGS. 10.0102AA–CN are to be assembled. After such assembly, FIGS. 10.0102AA–CN provide a circuit drawing of a correlator bias generator "dcorr__bias" included in the circuit of FIGS. 10.01AA–DI.

FIG. 10.02 is a graph illustrating how FIGS. 10.02AA–BE are to be assembled. After such assembly, FIGS. 10.02AA–BE provide a circuit drawing of a PN lock detector "pnlockdet" included in the circuit FIGS. 10AA–DD.

FIG. 10.0201 is a graph illustrating how FIGS. 10.0201AA–AB are to be assembled. After such assembly, FIGS. 10.0201AA–AB provide a circuit drawing of a counter bit "lockcounterbit" included in the circuit of FIGS. 10.02AA–BE.

FIG. 10.03 is a graph illustrating how FIGS. 10.03AA–AB are to be assembled. After such assembly, FIGS. 10.03AA–AB provide a circuit drawing of a PN generator clock "pngclk" included in the circuit of FIGS. 10AA–DD.

FIG. 10.04 is a graph illustrating how FIGS. 10.04AA–CE are to be assembled. After such assembly, FIGS. 10.04AA–CE provide a circuit drawing of a PN generator shift register "pngshr" included in the circuit of FIGS. 10 AA–DD.

FIG. 10.0401 is a circuit drawing of a PN generator shift register cell "pngsreg" included in the circuit of FIGS. 10.04AA–CE.

FIG. 10.0402 is a graph illustrating how FIGS. 10.0402AA–CB are to be assembled. After such assembly, FIGS. 10.0402AA–CB provide a circuit drawing of a PN generator shift register summer "pngssum" included in the circuit of FIGS. 10.04AA–CE.

FIG. 10.05 is a circuit drawing of a PN controller D type flip-flop "pnddff" included in the circuit of FIGS. 10AA–DD.

FIG. 10.06 is a graph illustrating how FIGS. 10.06AA–DH are to be assembled. After such assembly, FIGS. 10.06AA–DH provide a as circuit drawing of differential and PN encoder "dpenc" included in the circuit of FIGS. 10AA–DD.

FIG. 10.07 is a graph illustrating how FIGS. 10.07AA–CD are to be assembled. After such assembly, FIGS. 10.07AA–CD provide a circuit drawing of a PSK/FSK generator "fskgen" included in the circuit of FIGS. 10AA–DD.

FIG. 10.0701 is a graph illustrating how FIGS. 10.0701AA–AB are to be assembled. After such assembly, FIGS. 10.0701AA–AB provide a circuit drawing of a FSK counter bit "fskcbit" included in the circuit of FIGS. 10AA–DD.

Figure 11A:
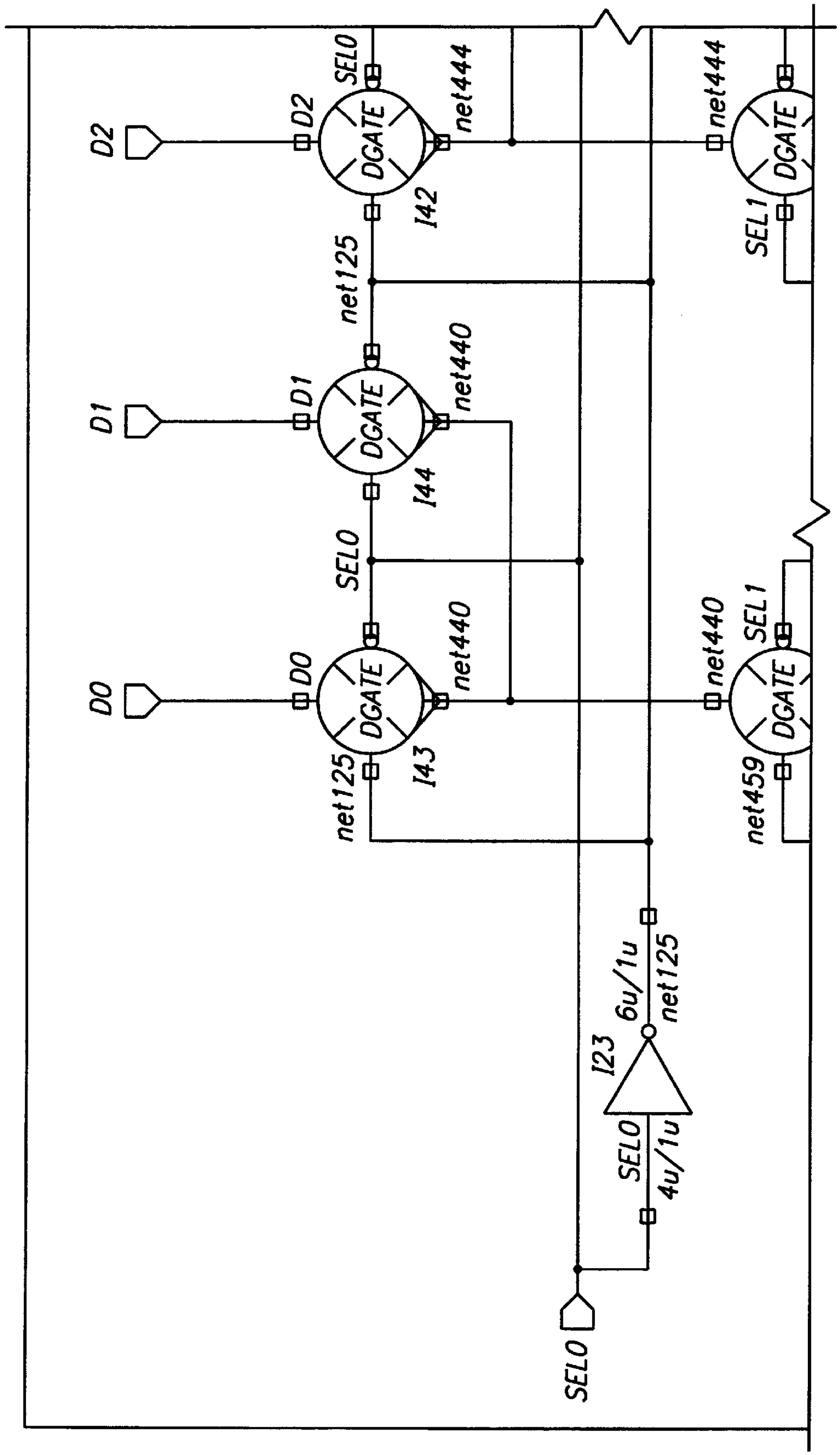
Figure 11:
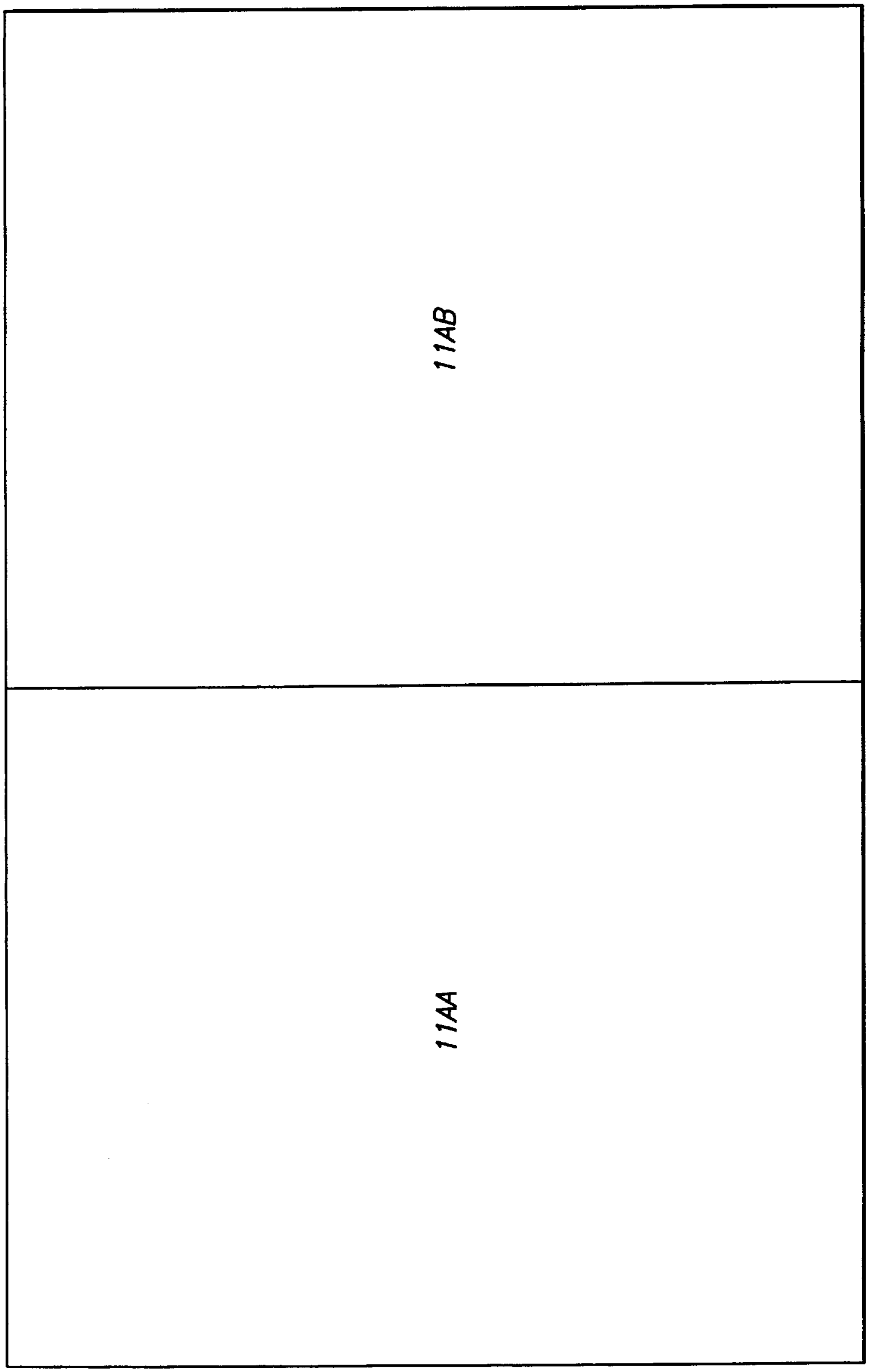
Figure 11A:
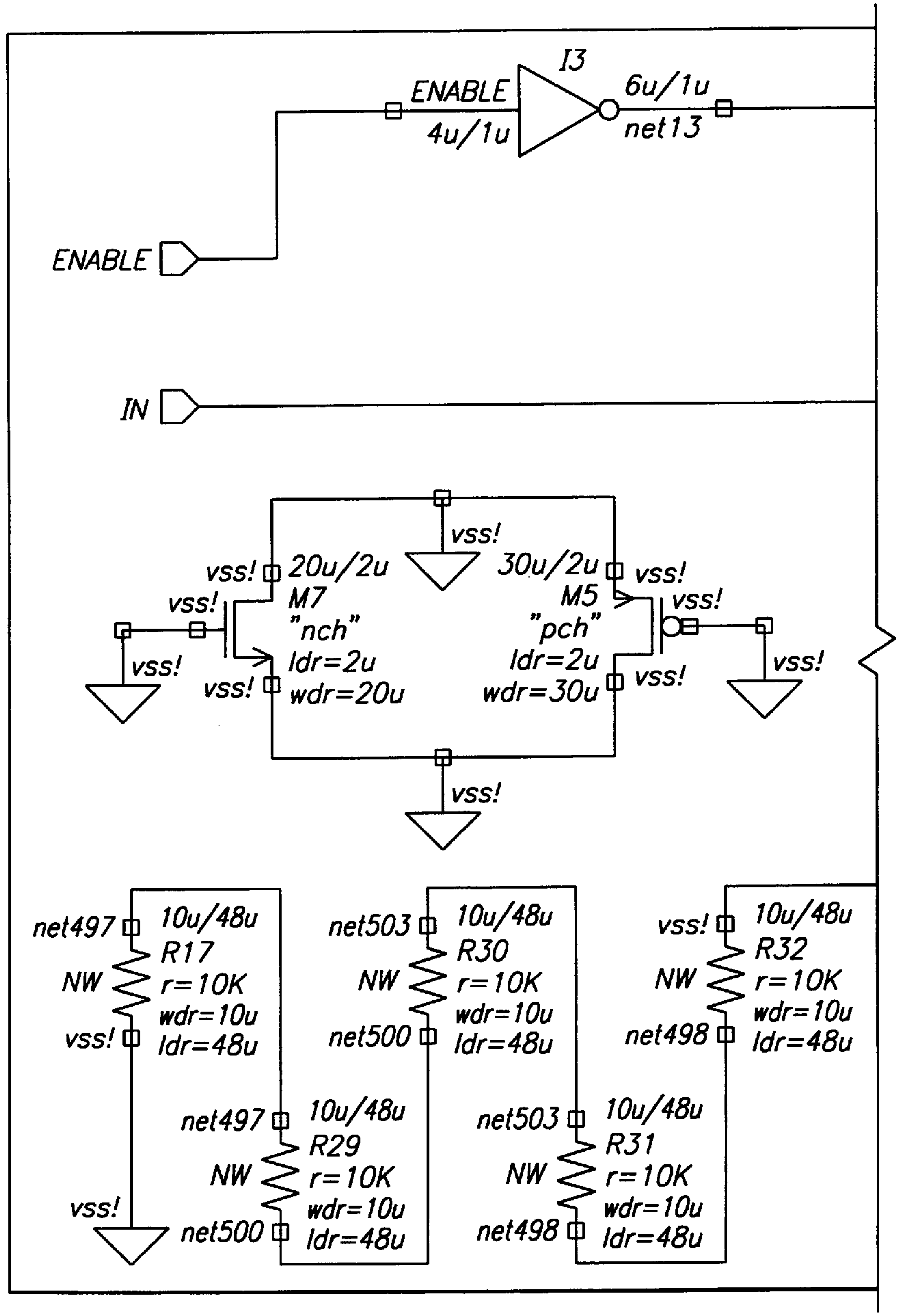
Figure 11A:
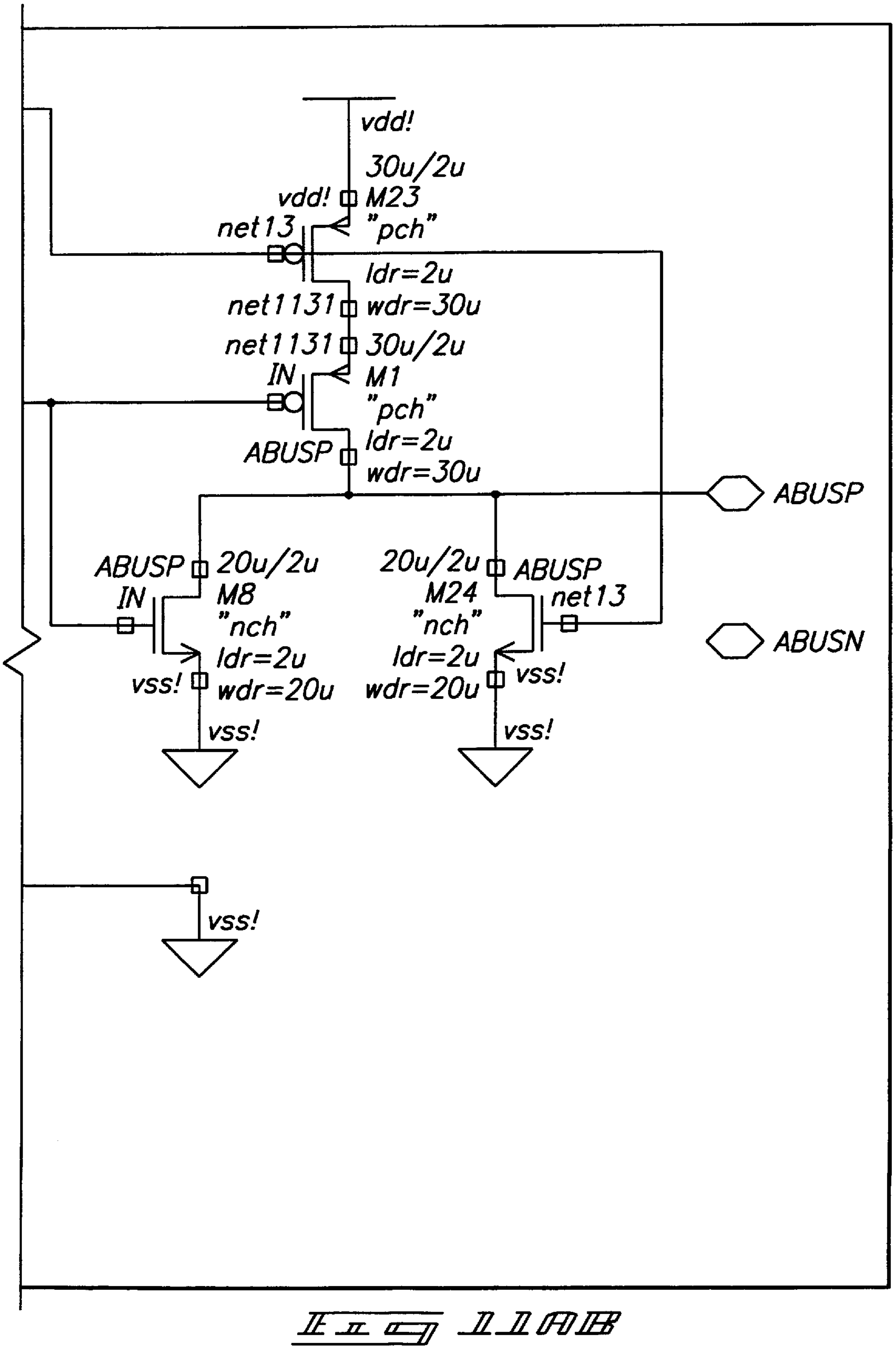

FIG. 11 is a graph illustrating how FIGS. 11AA–AB are to be assembled. After such assembly, FIGS. 11AA–AB provide a circuit drawing of a battery I/O buffer "batalg" included in the circuit of FIGS. 6AA–EK.

Figure 12:
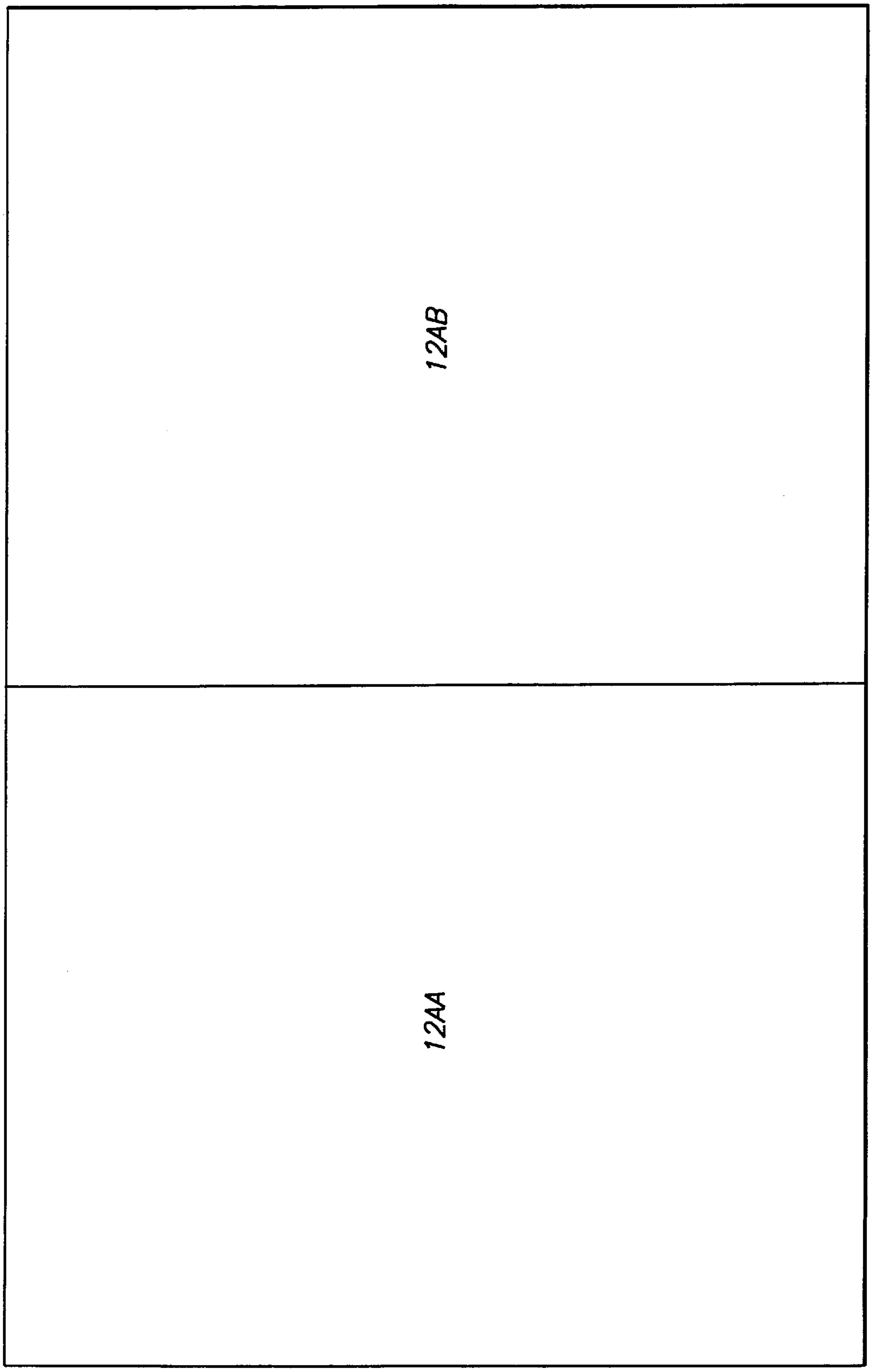
Figure 12A:
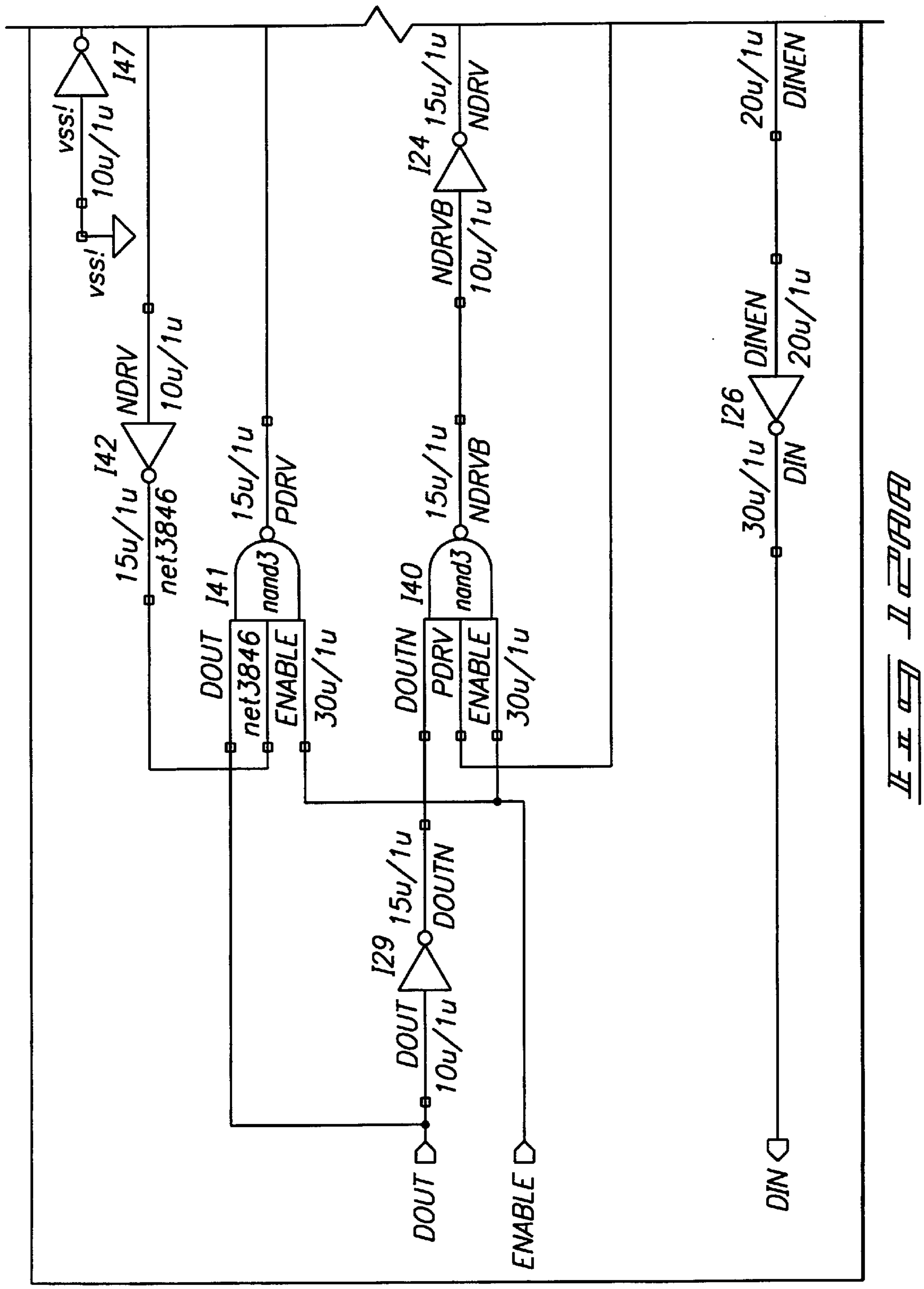
Figure 112A:
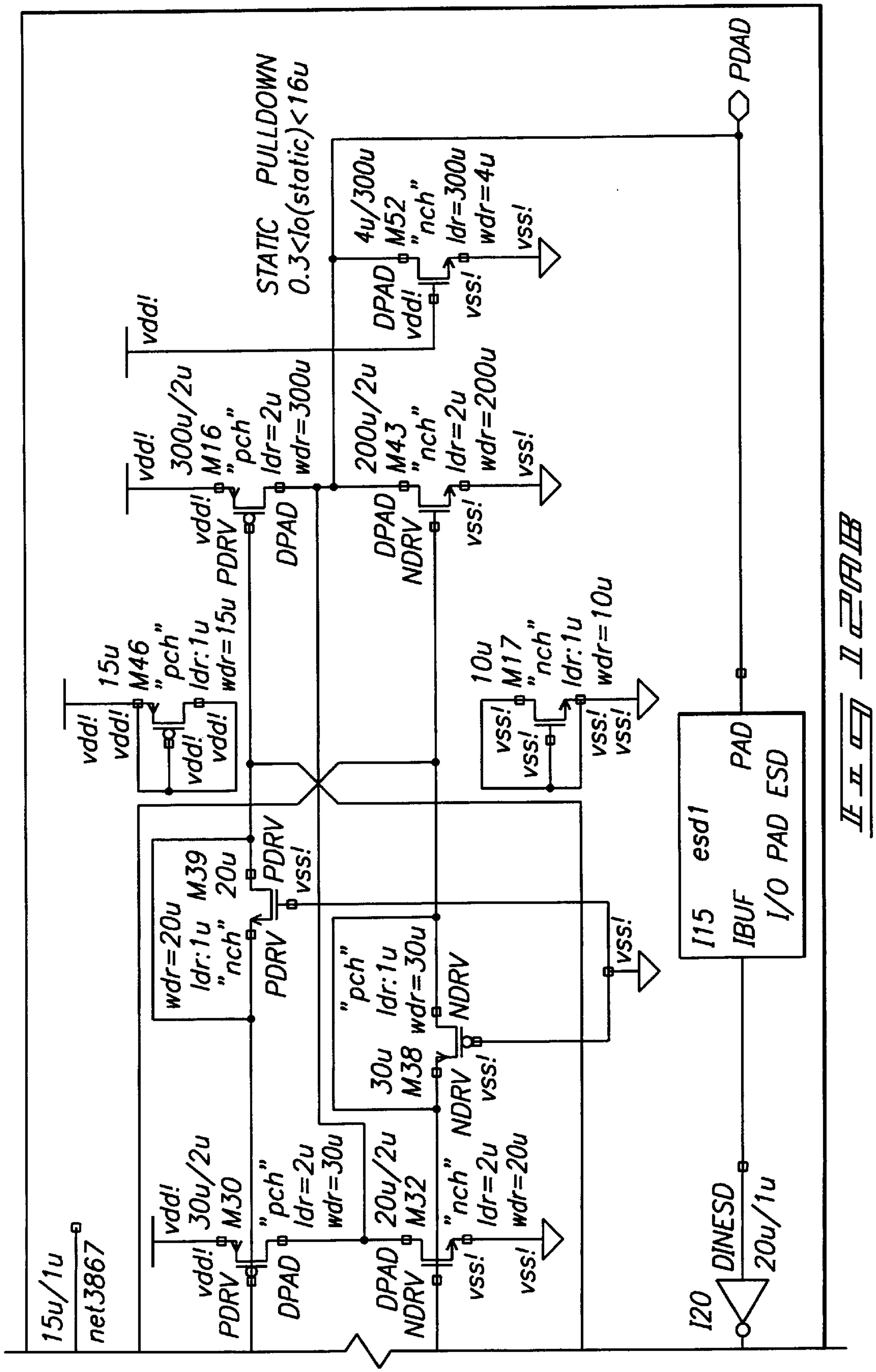
Figure 1E:
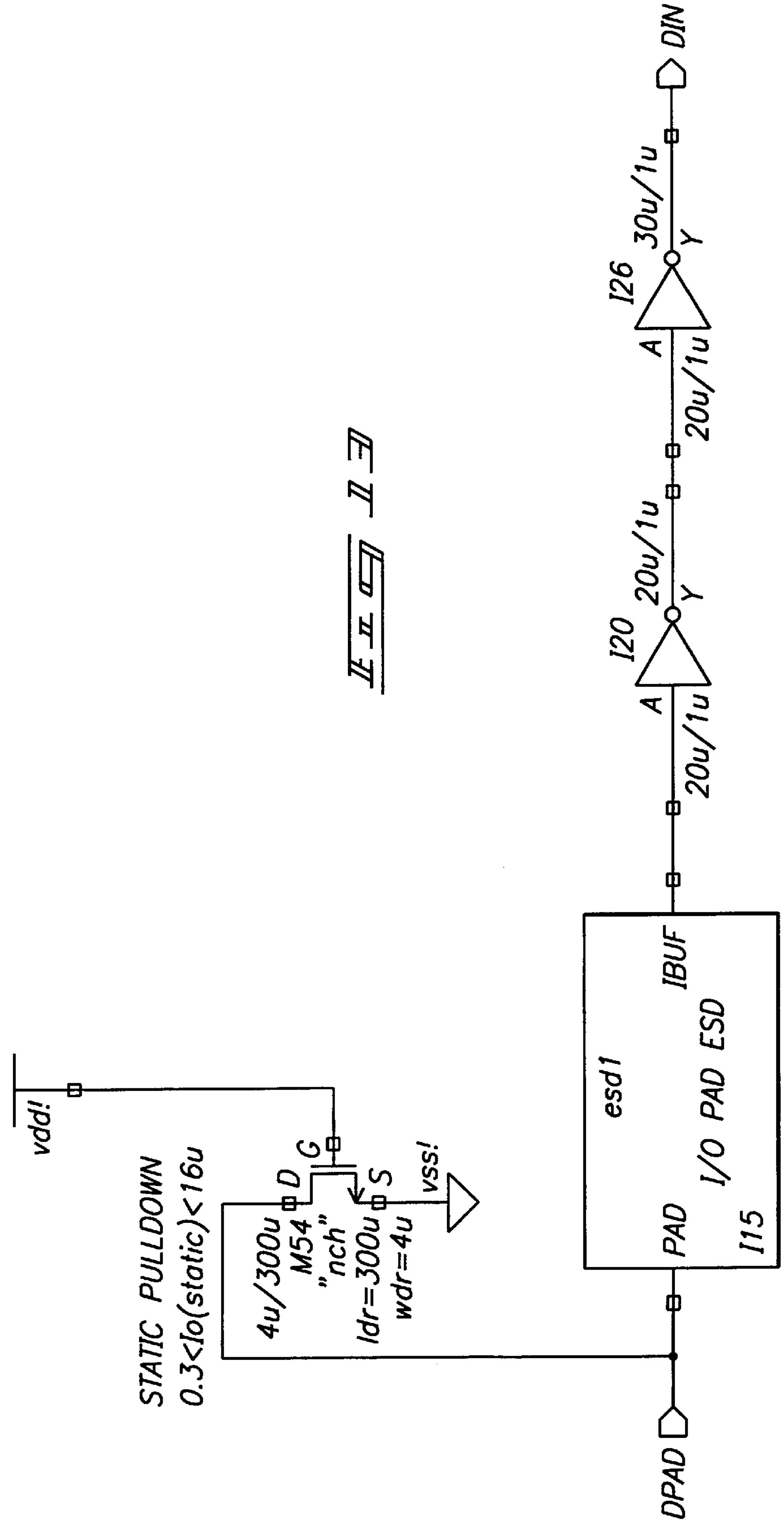
Figure 115:
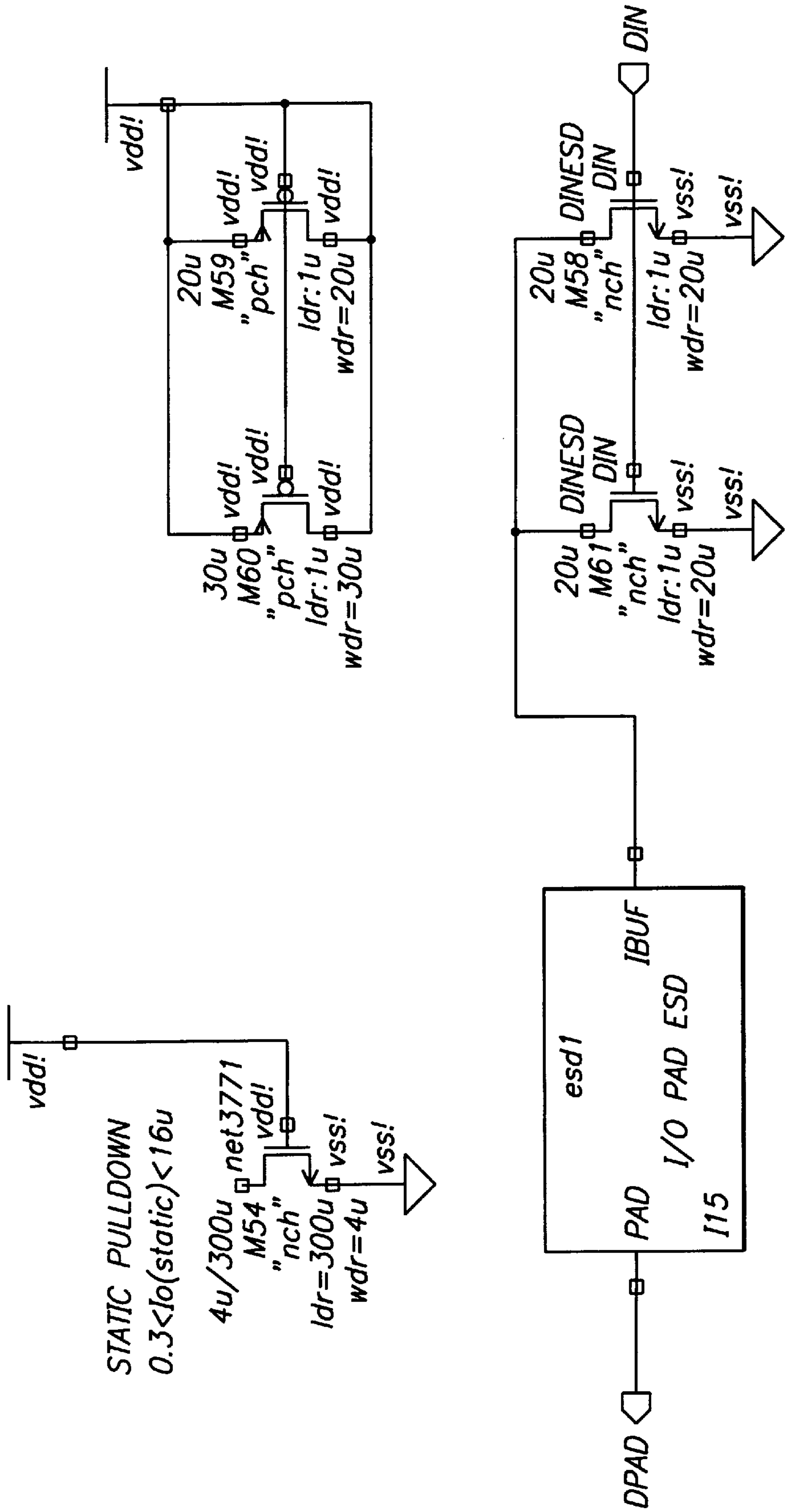

FIG. 12 is a graph illustrating how FIGS. 12AA–AB are to be assembled. After such assembly, FIGS. 12AA–AB provide a circuit drawing of a digital I/O pad buffer "paddig" included in the circuit of FIGS. 6AA–EK.

Figure 6A:
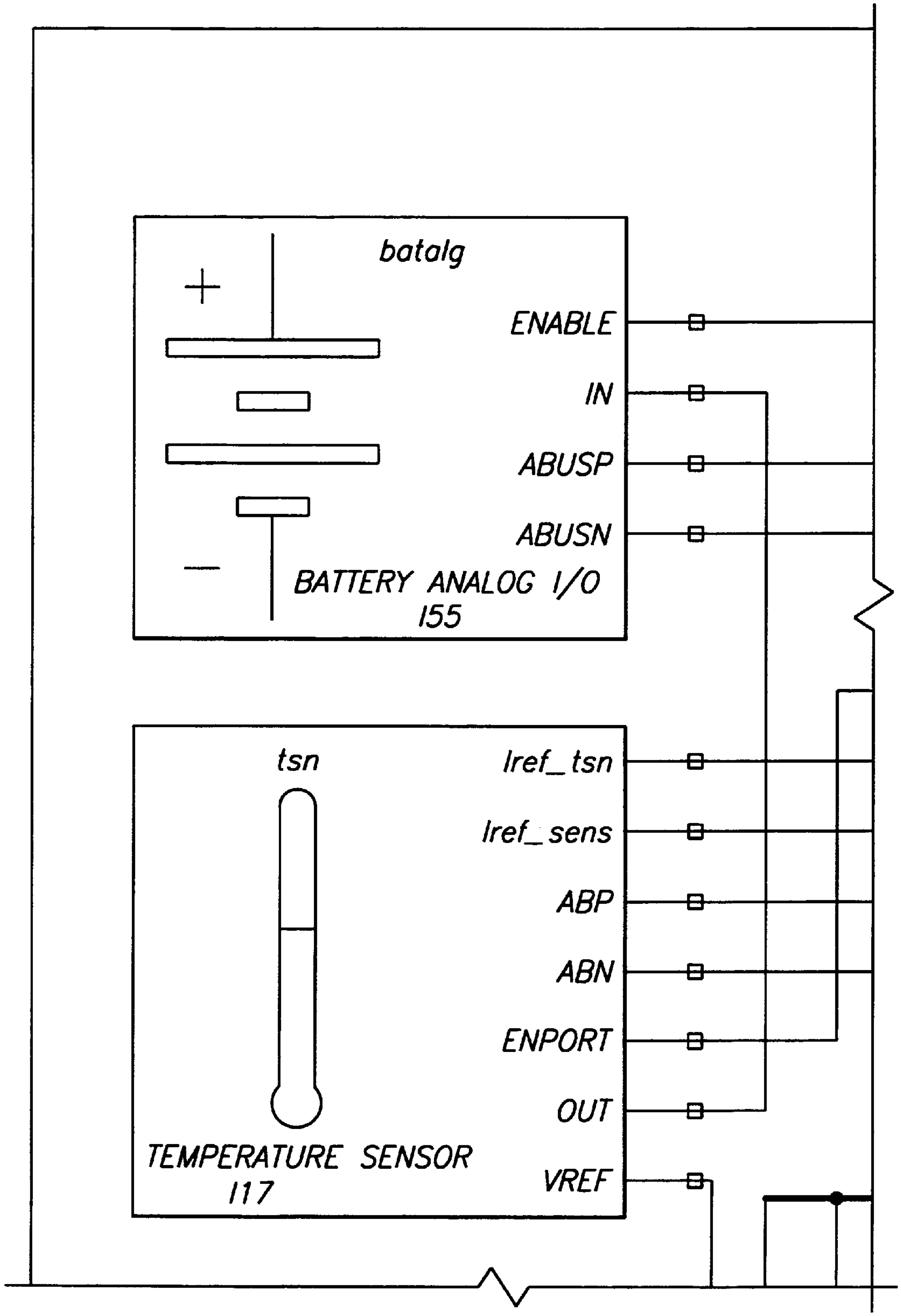
FIG. 6 is a graph illustrating how FIGS. 6AA–EK are to be assembled. After such assembly, FIGS. 6AA–EK provide a circuit drawing of another high level circuit schematic of the monolithic semiconductor integrated circuit of FIG. 5, showing pads and other details.
Figure 6A:
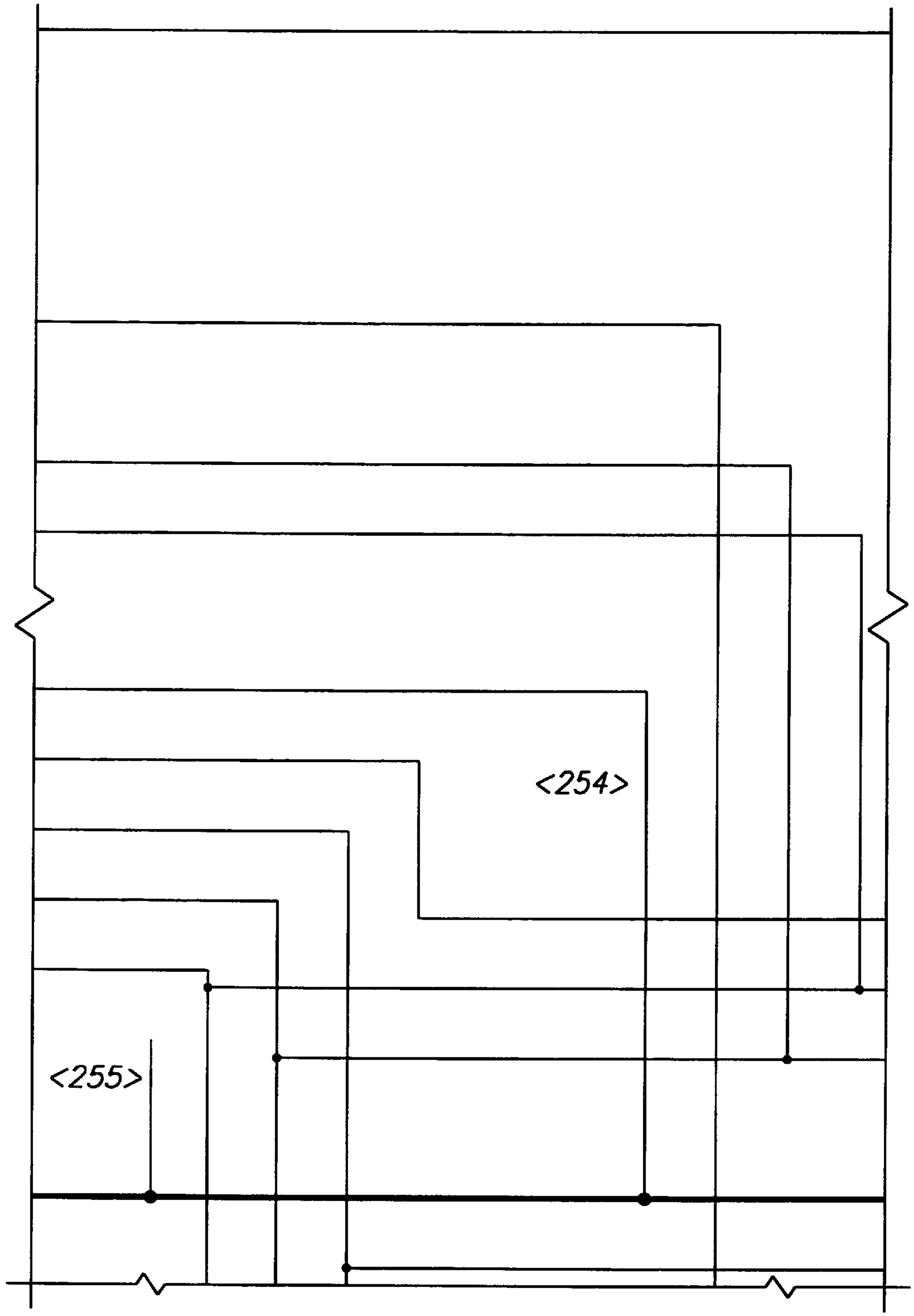
Figure 6A:
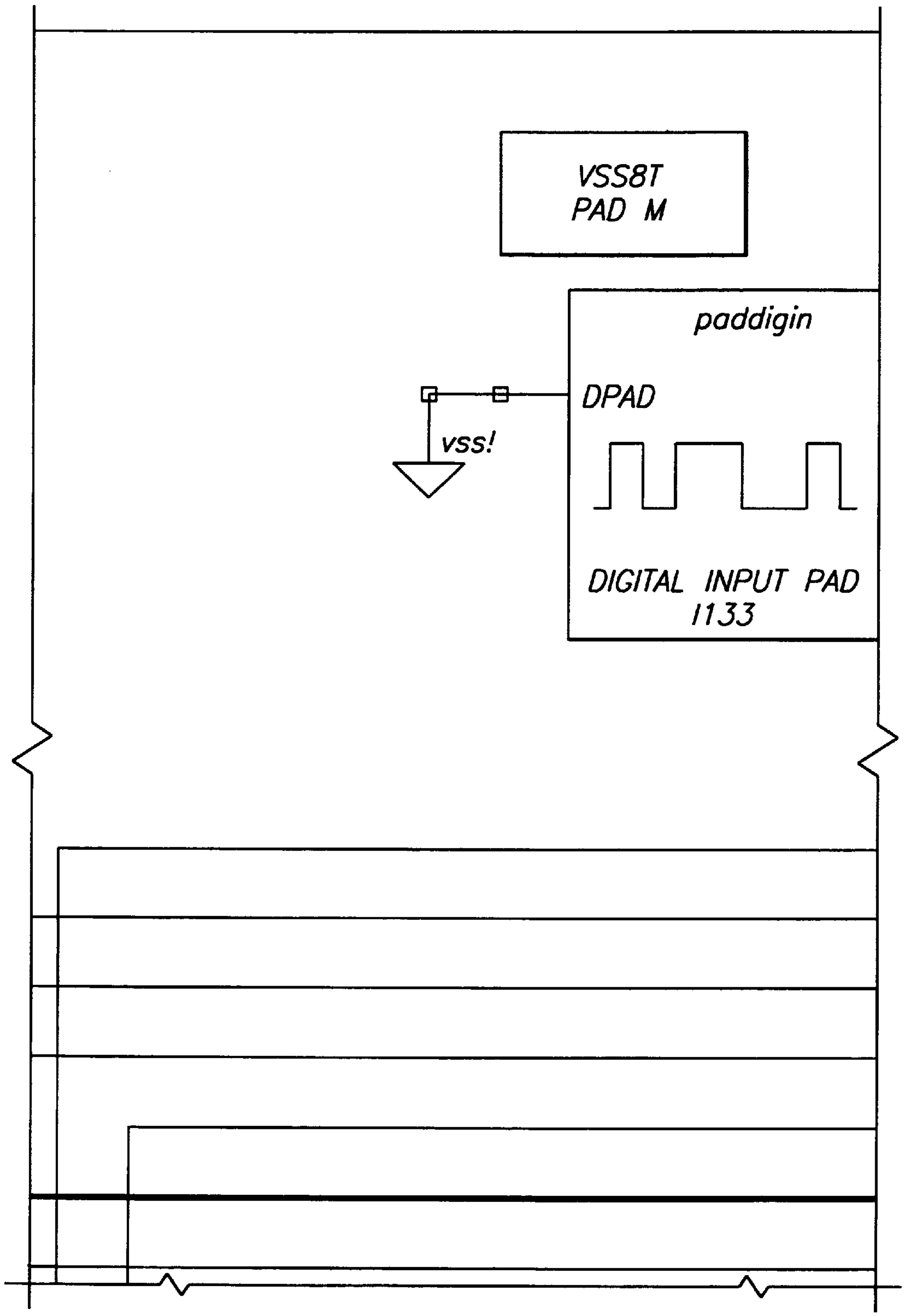
Figure 6A:
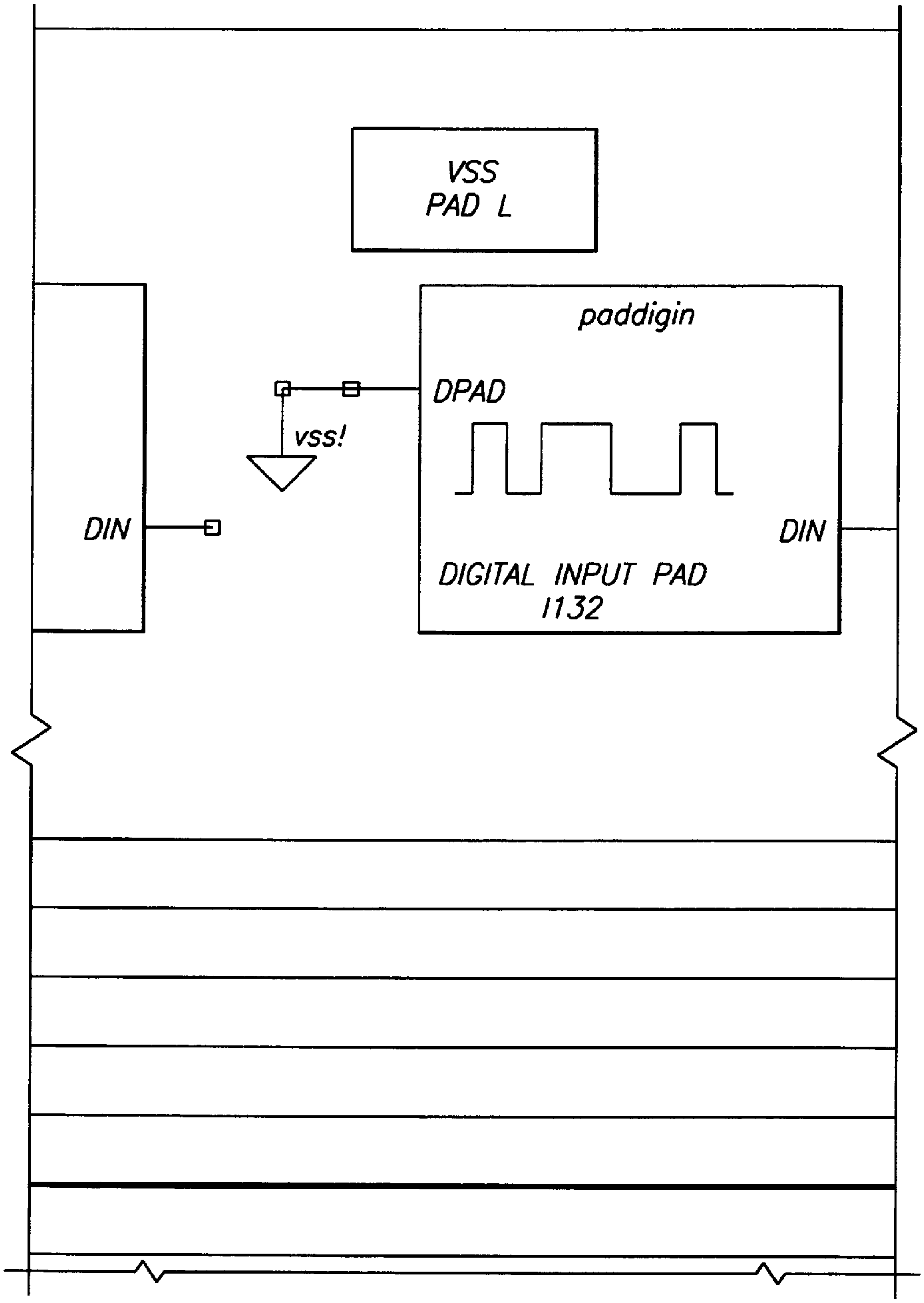
Figure 6A:
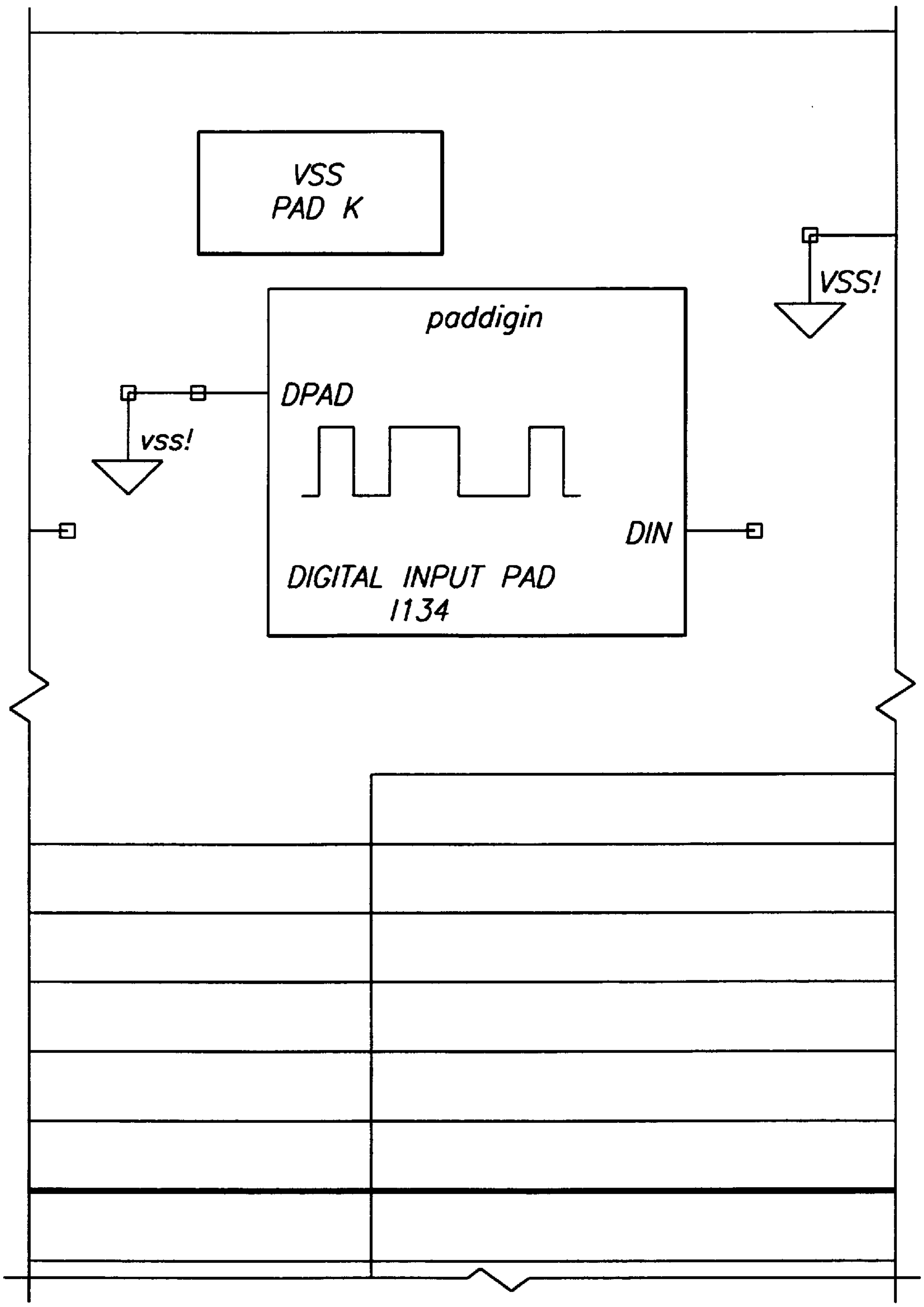
Figure 6A:
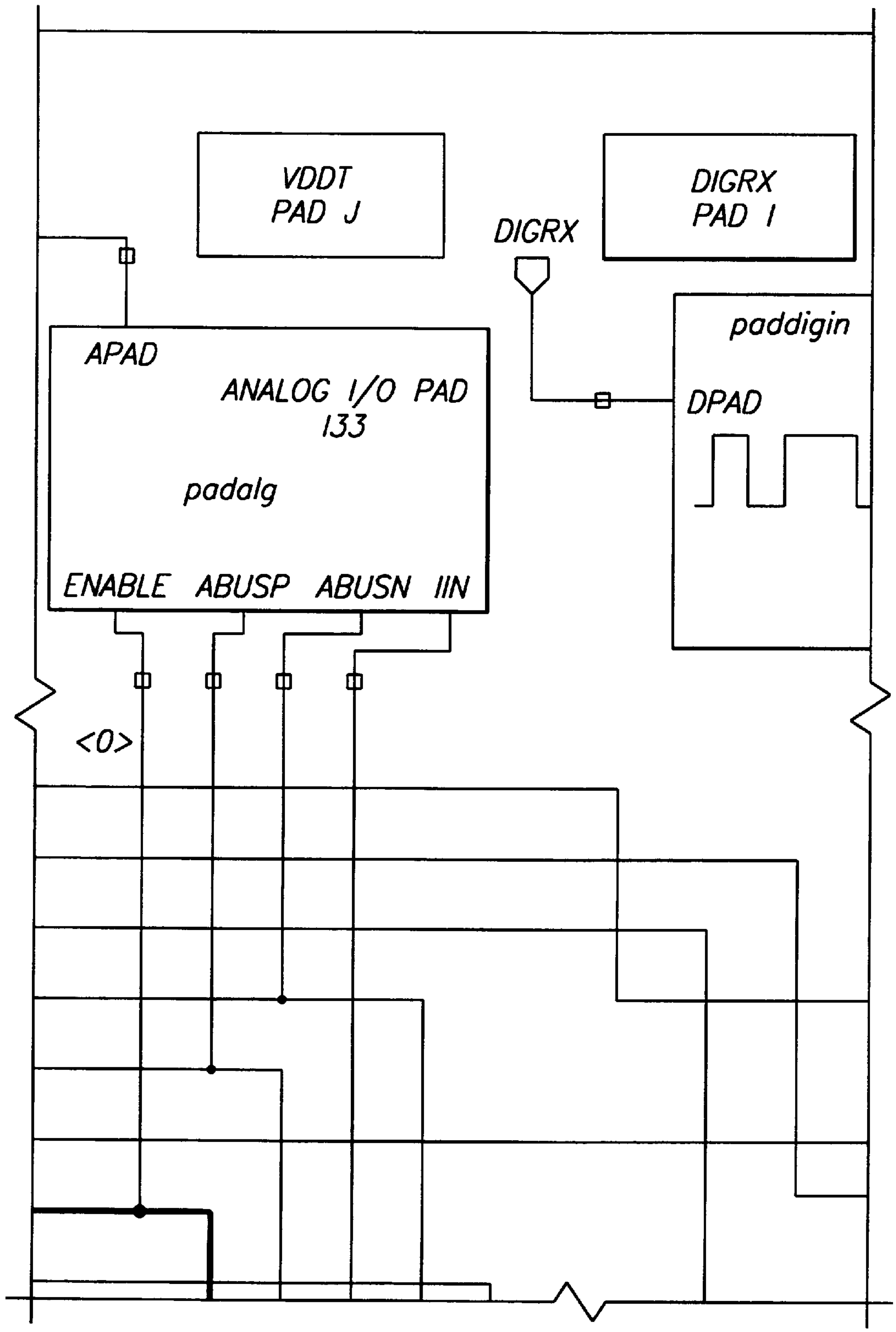
Figure 6A:
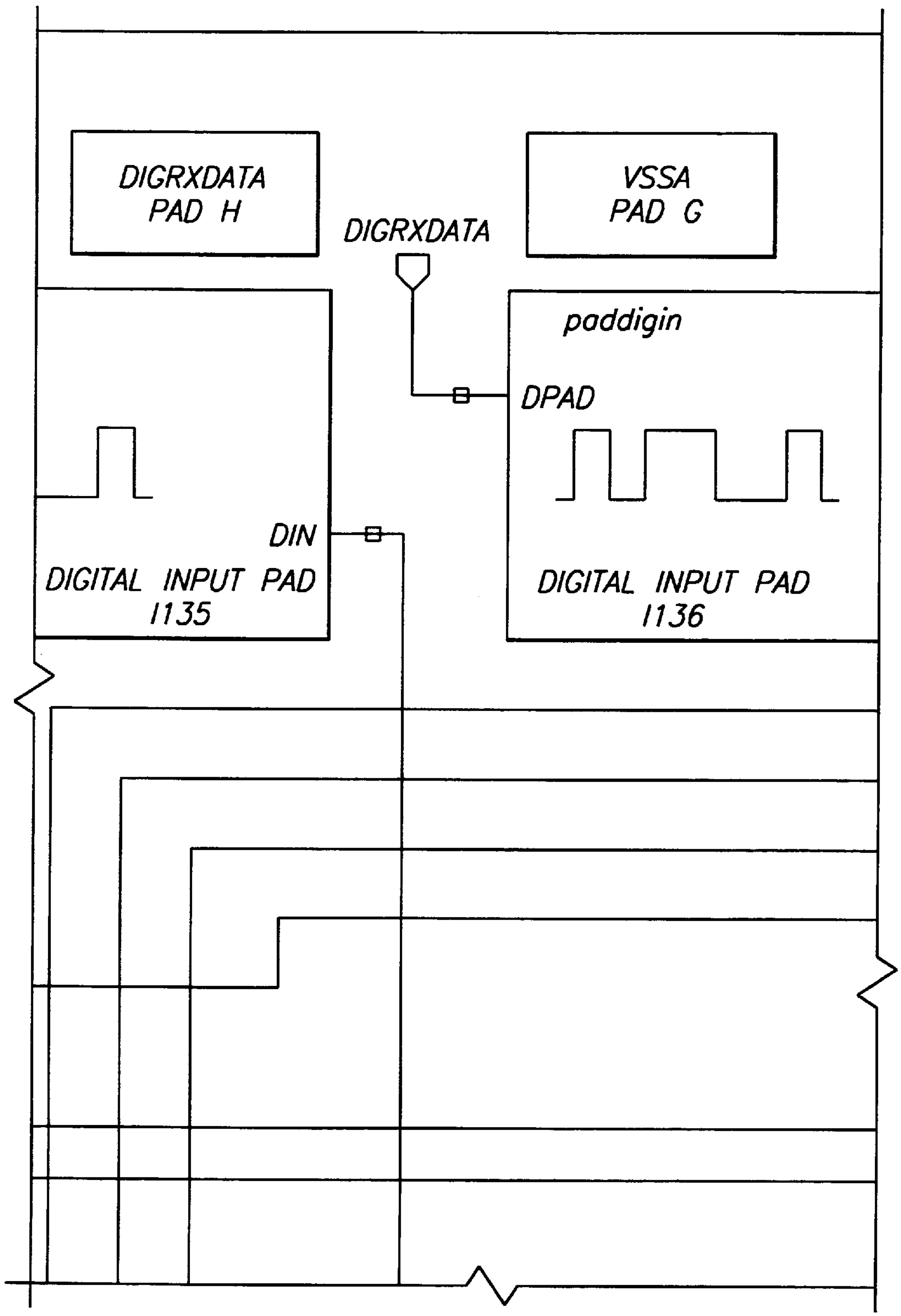
Figure 6A:
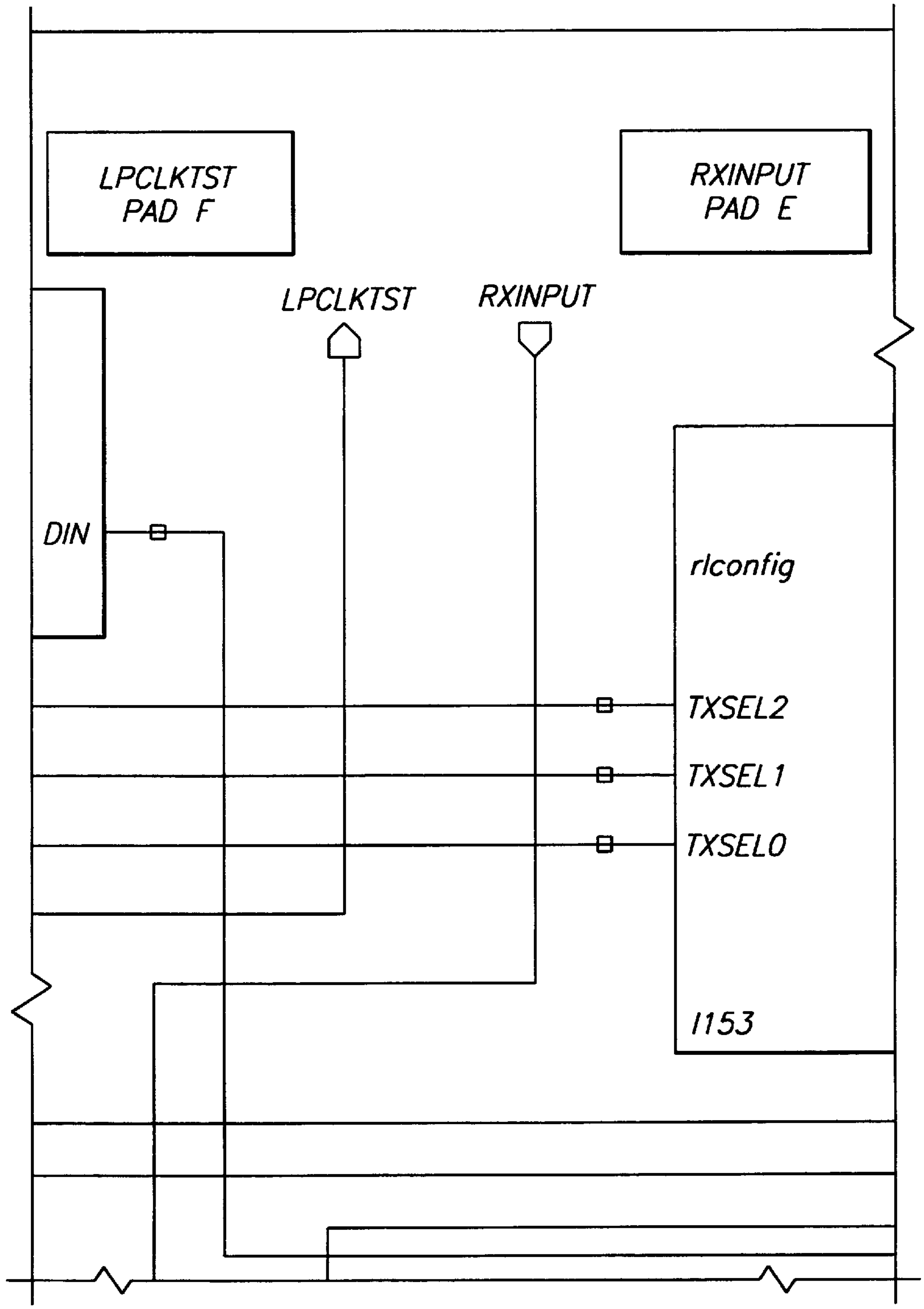
Figure 6A:
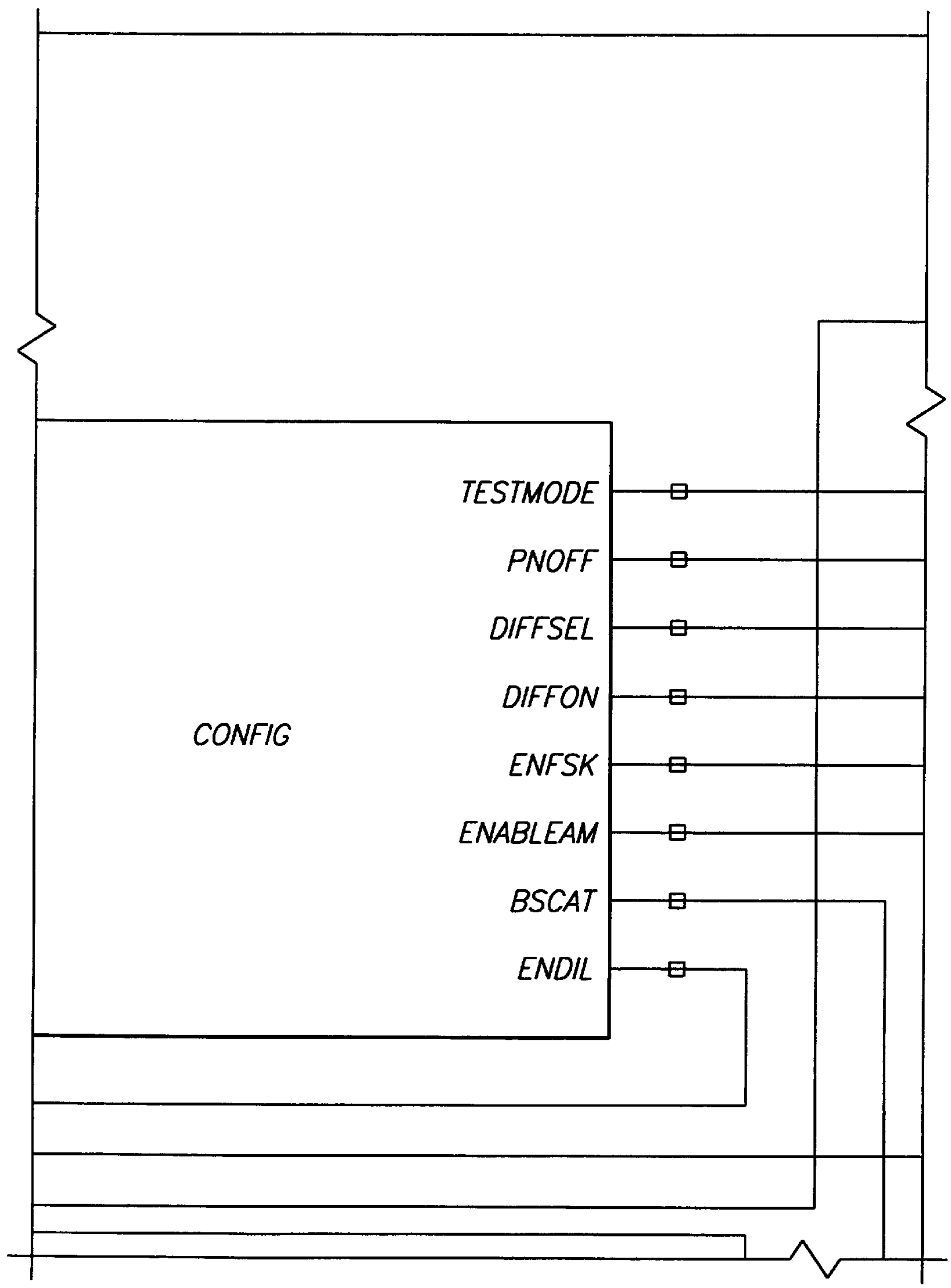
Figure 6A:
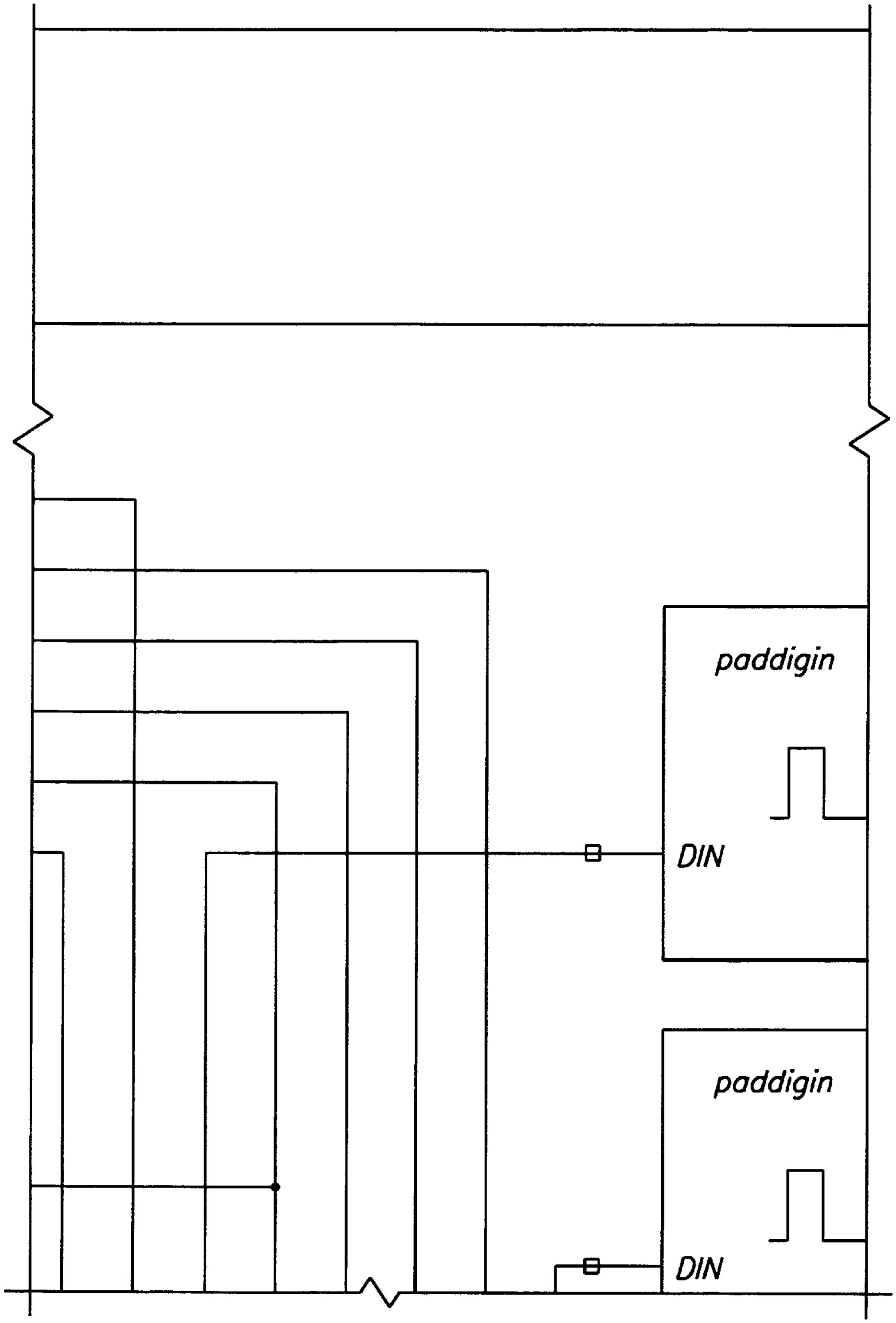
Figure 6A:
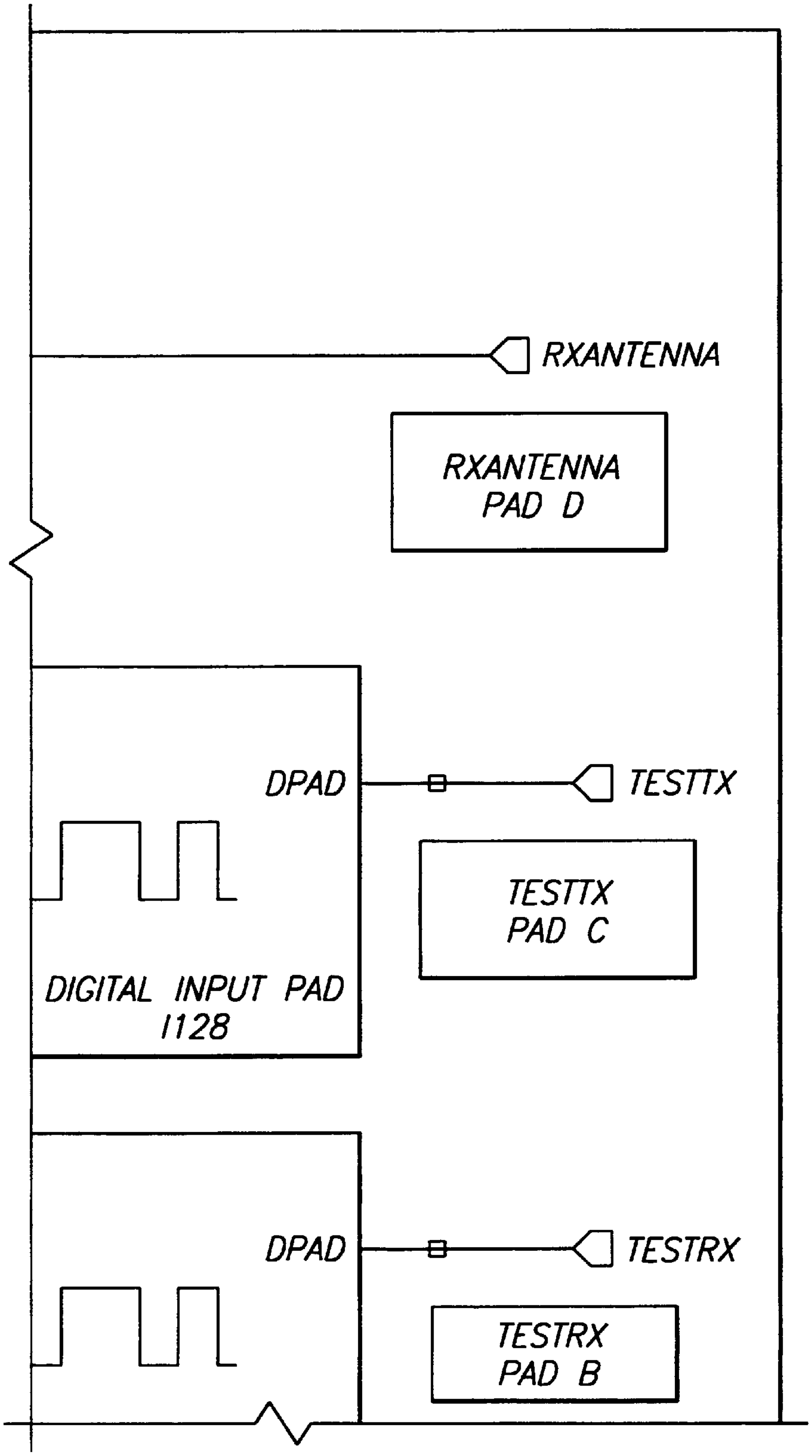
Figure 6B:
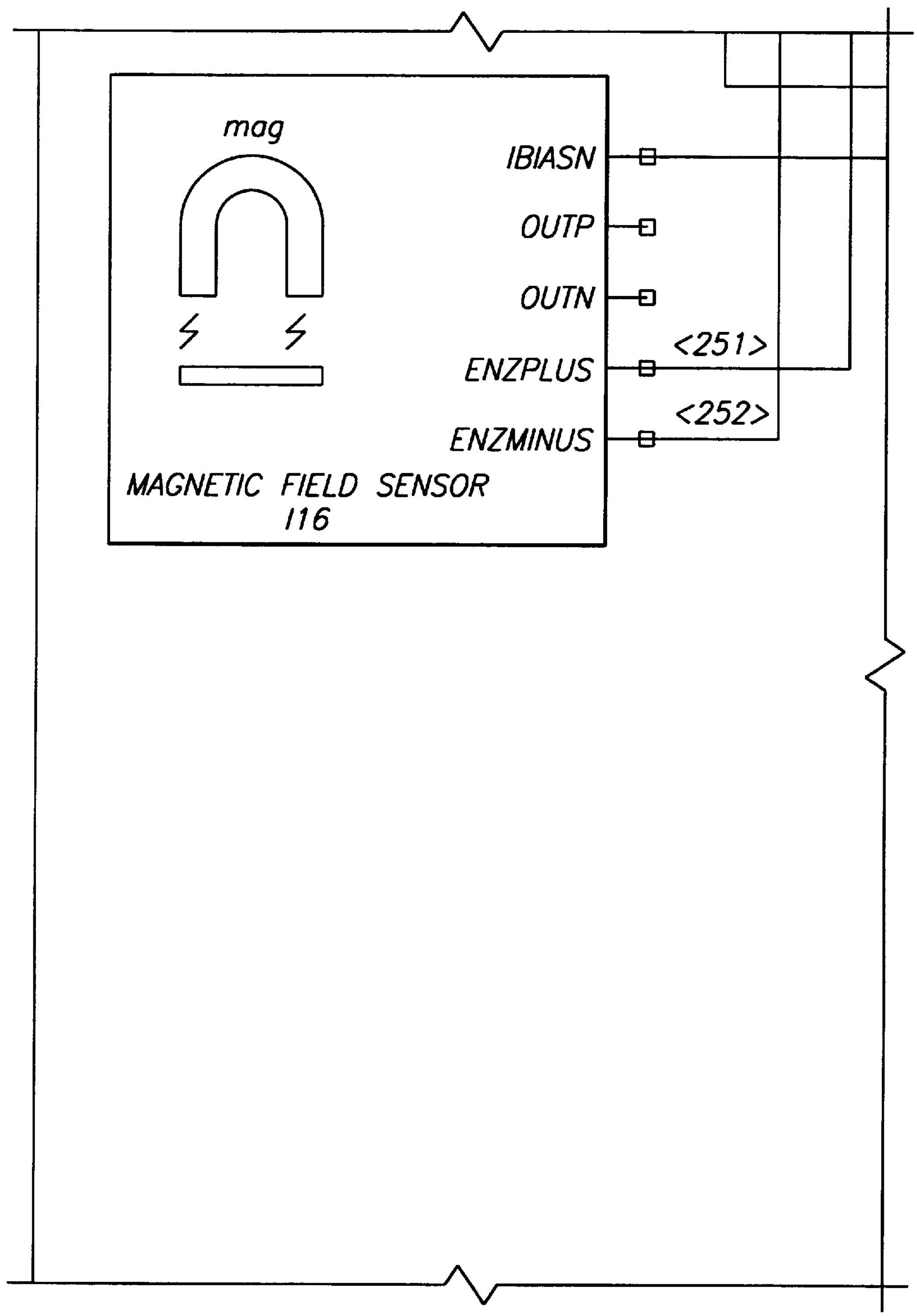
Figure 6B:
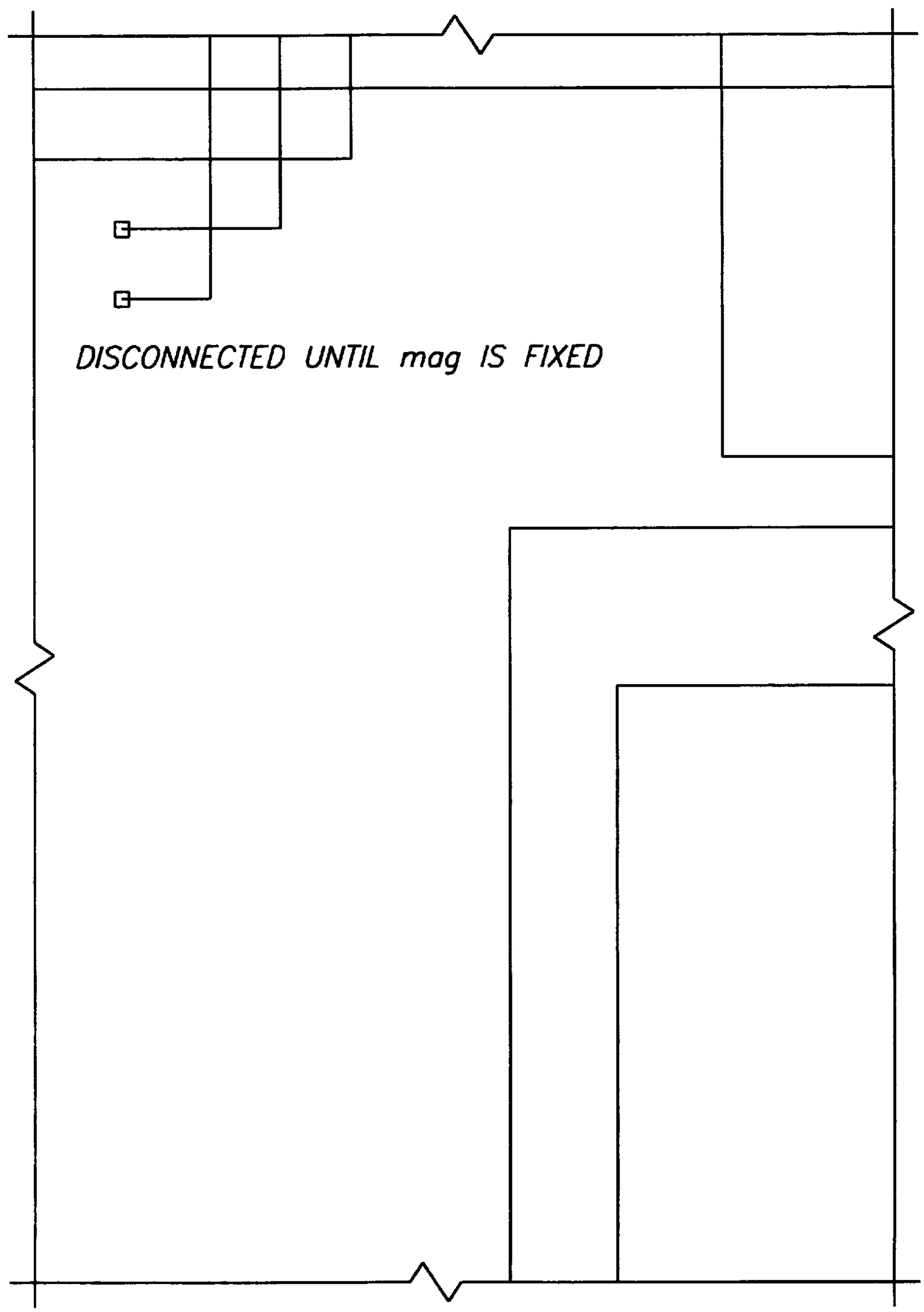
Figure 6B:
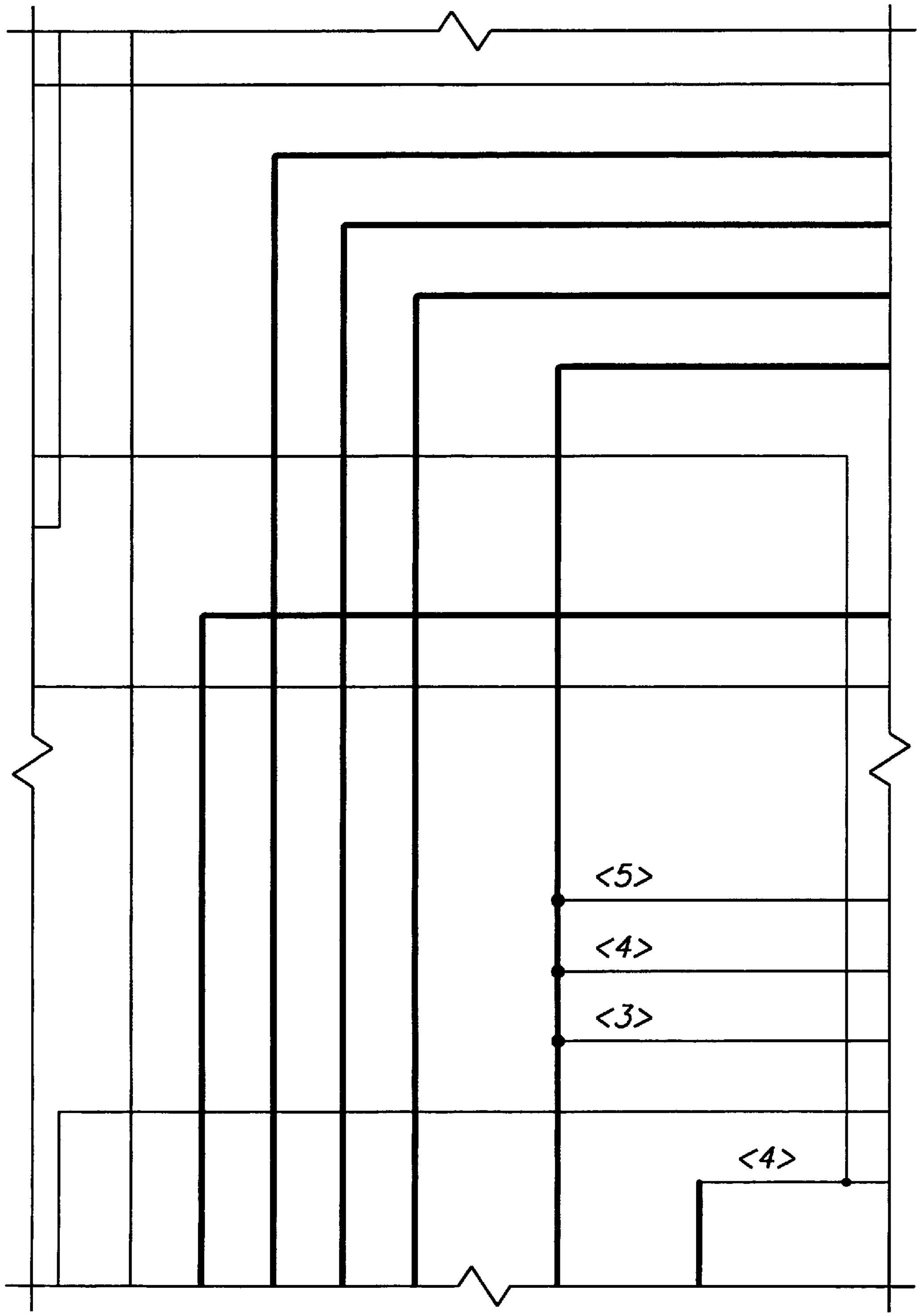
Figure 6B:
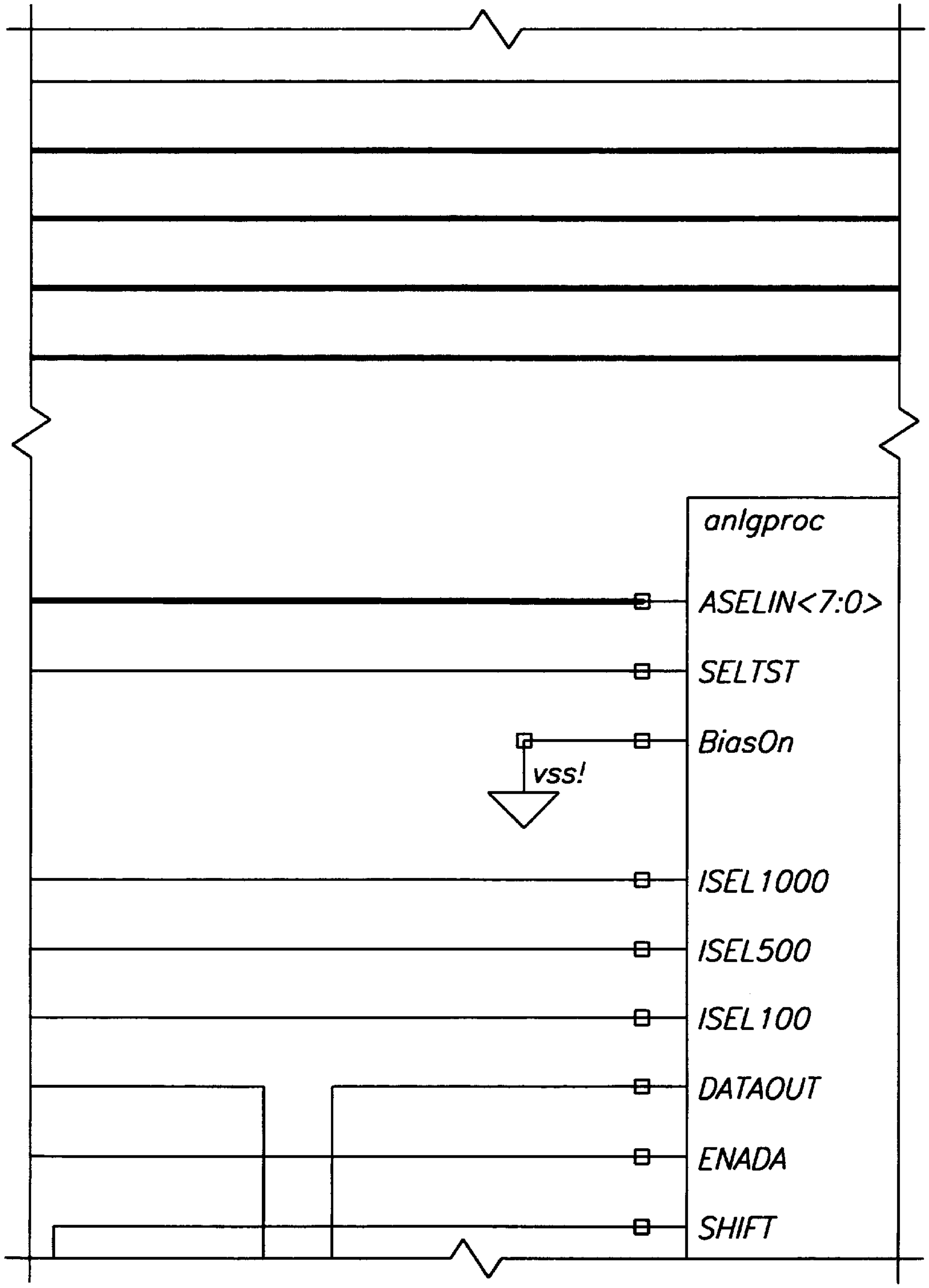
Figure 6B:
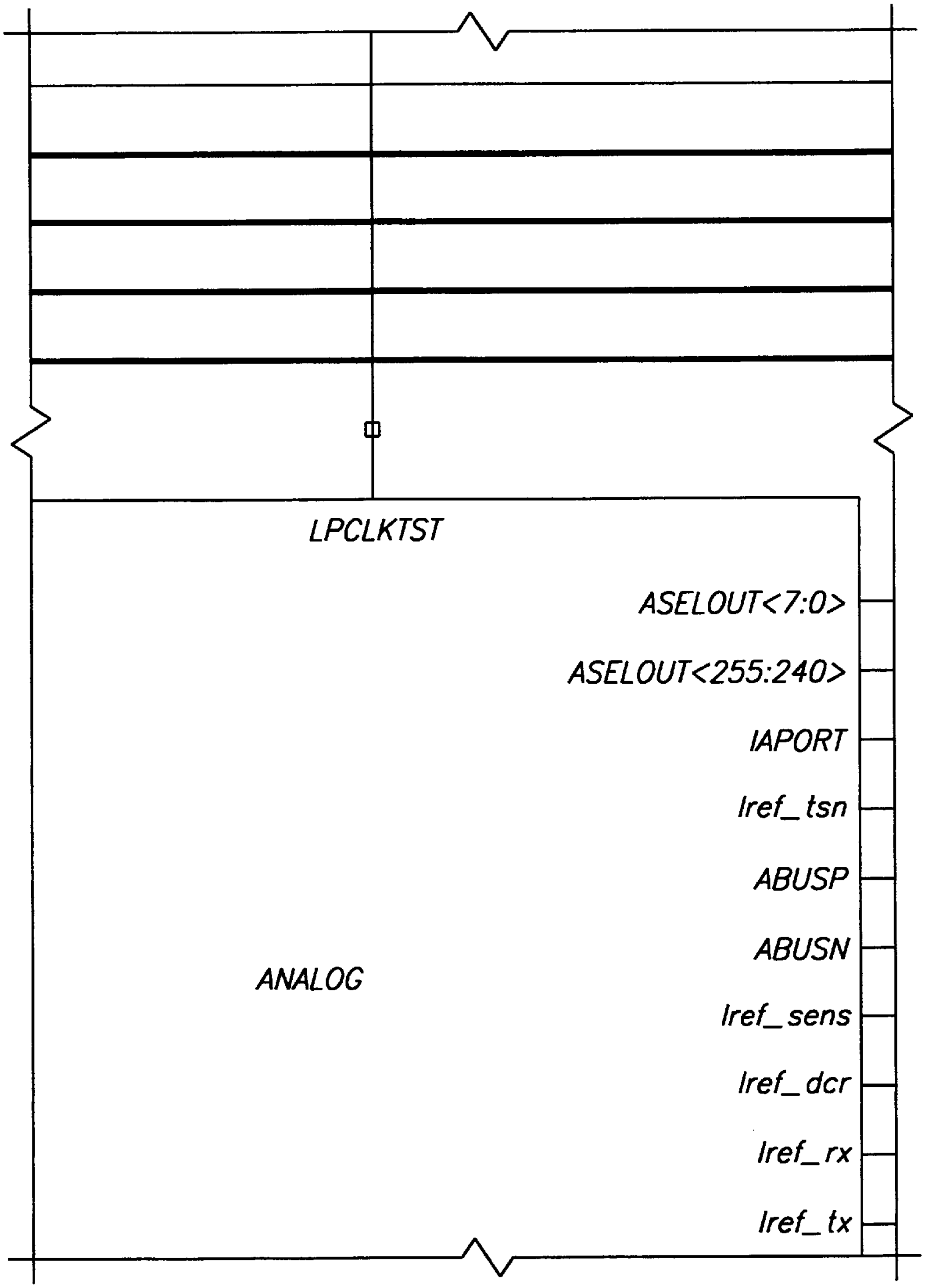
Figure 6B:
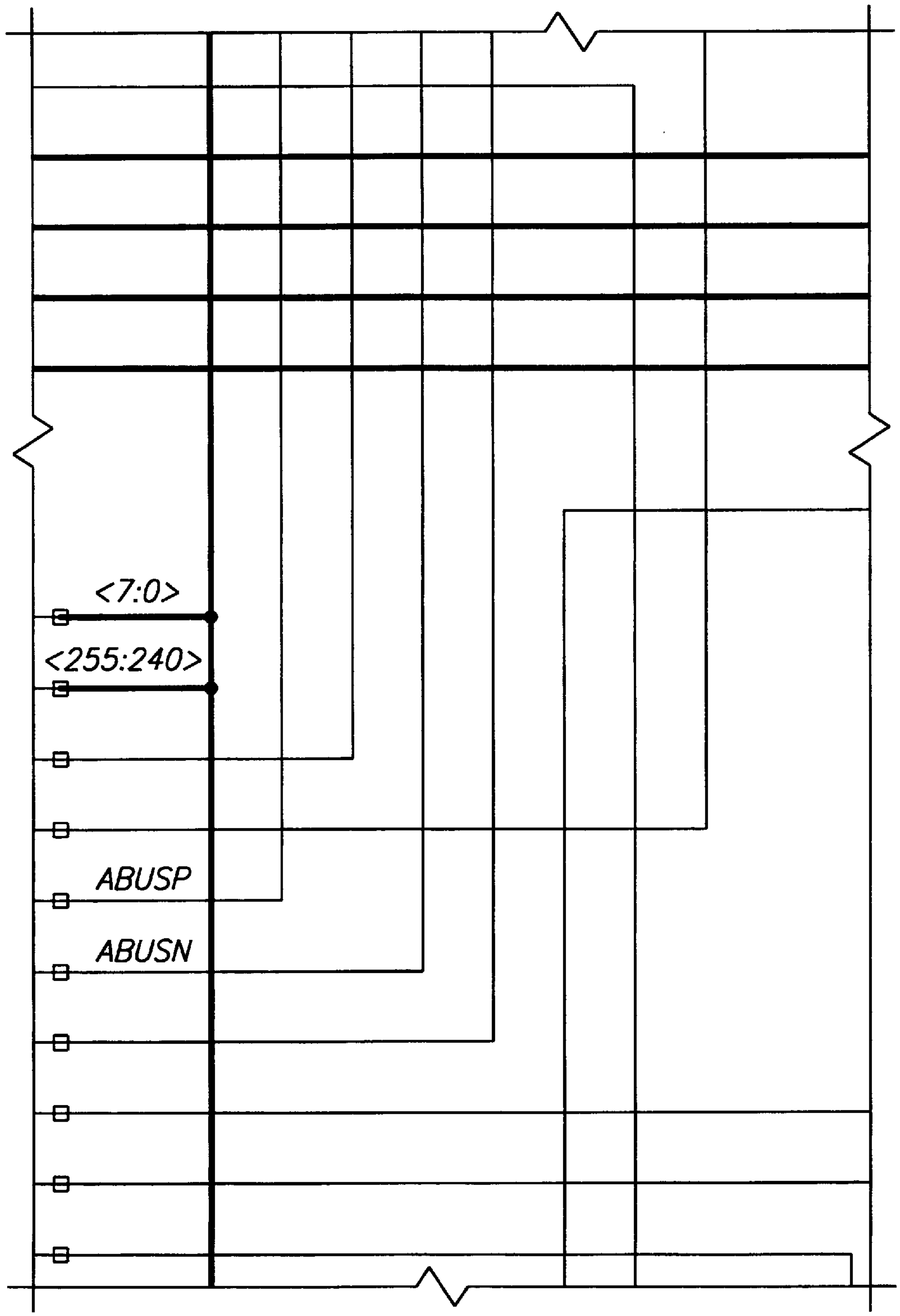
Figure 6B:
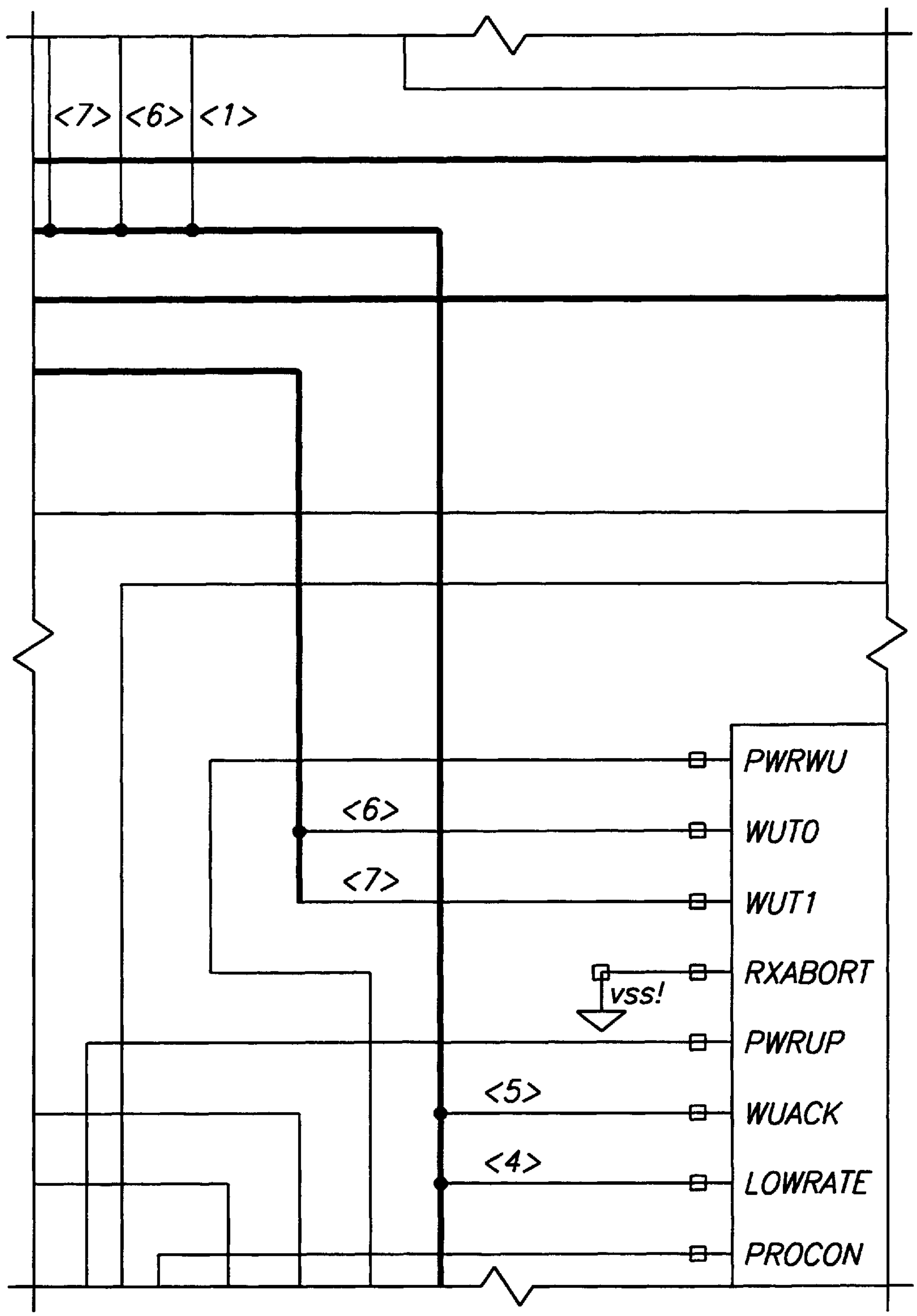
Figure 6B:
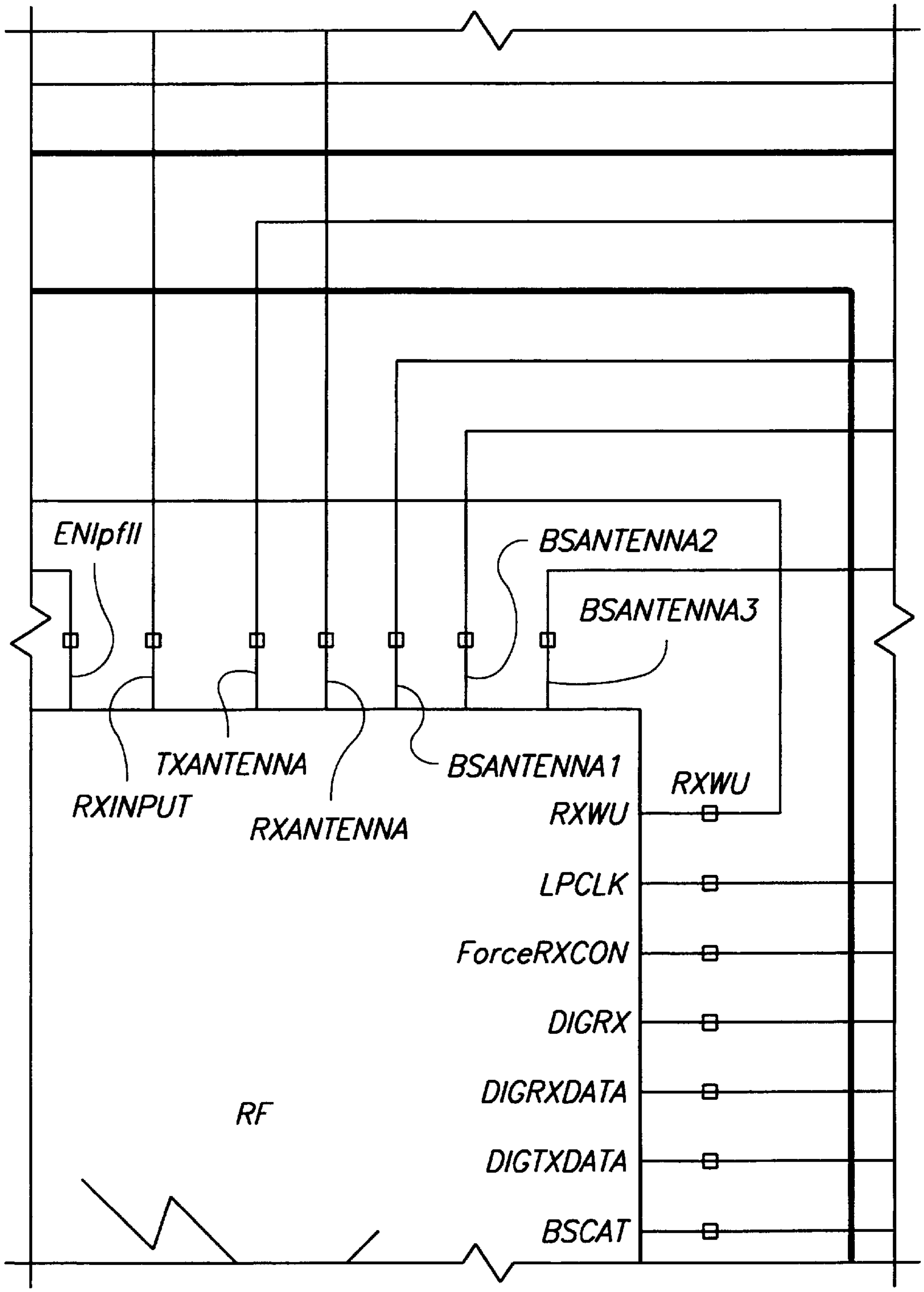
Figure 6B:
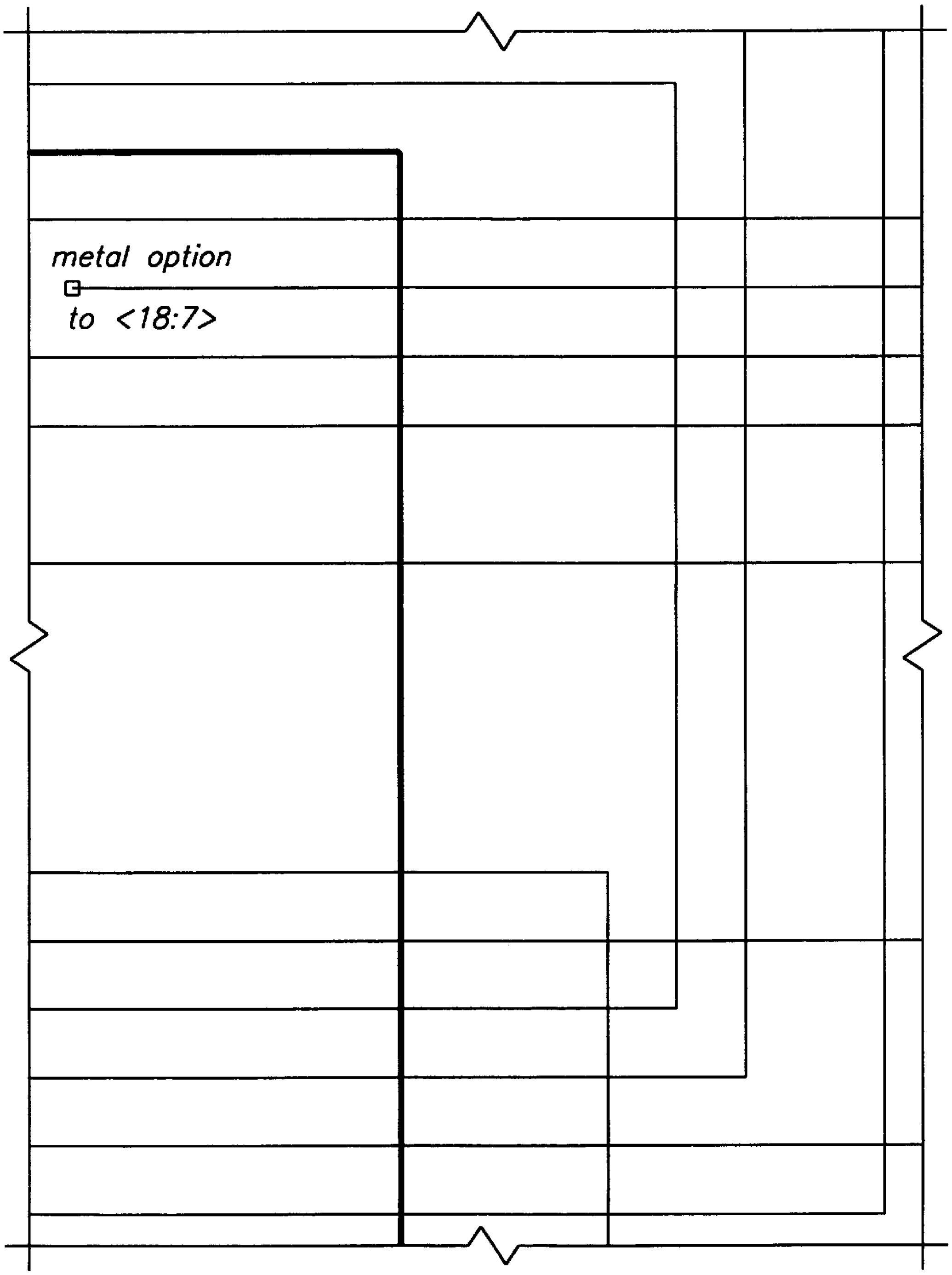
Figure 6B:
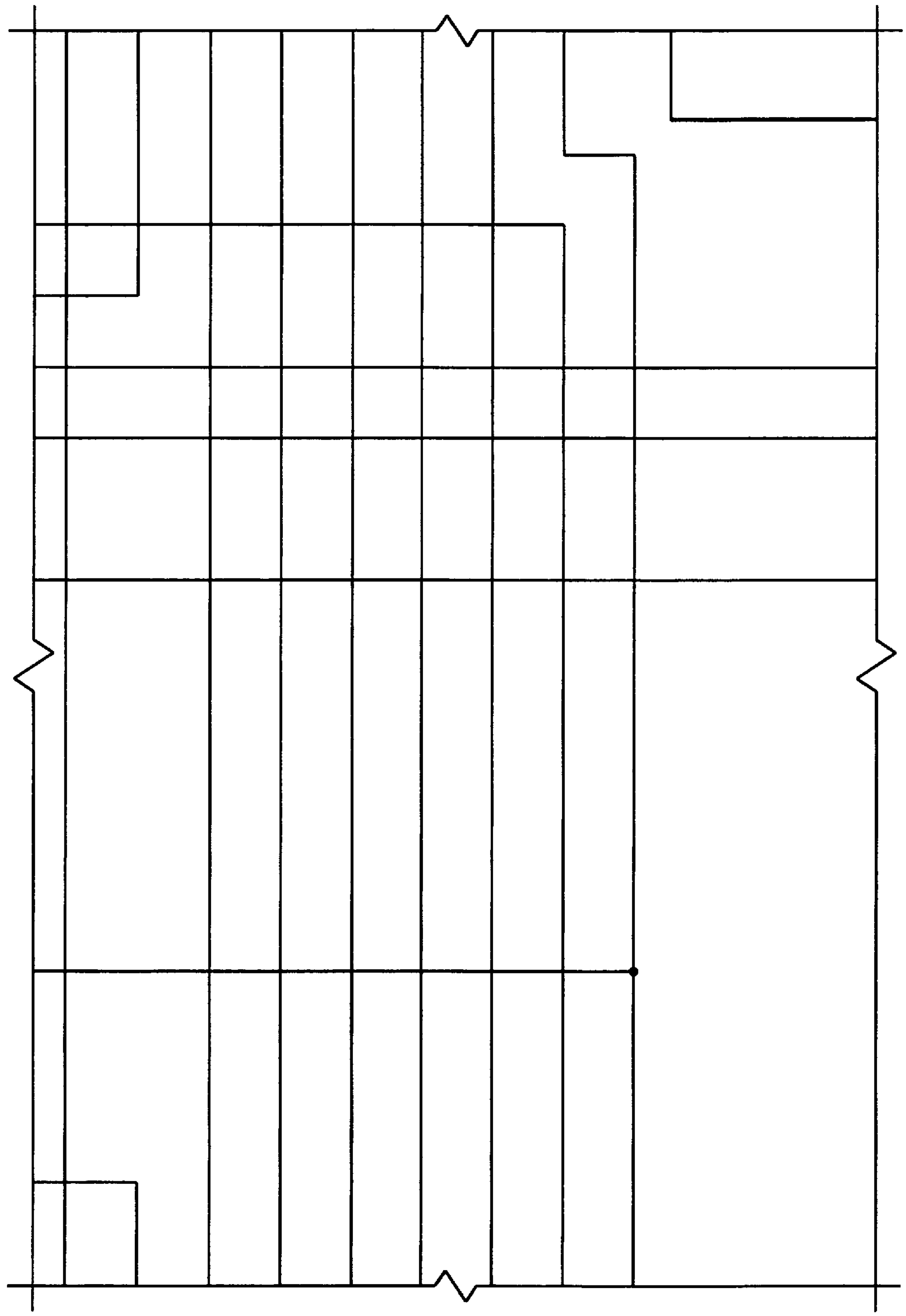
Figure 6B:
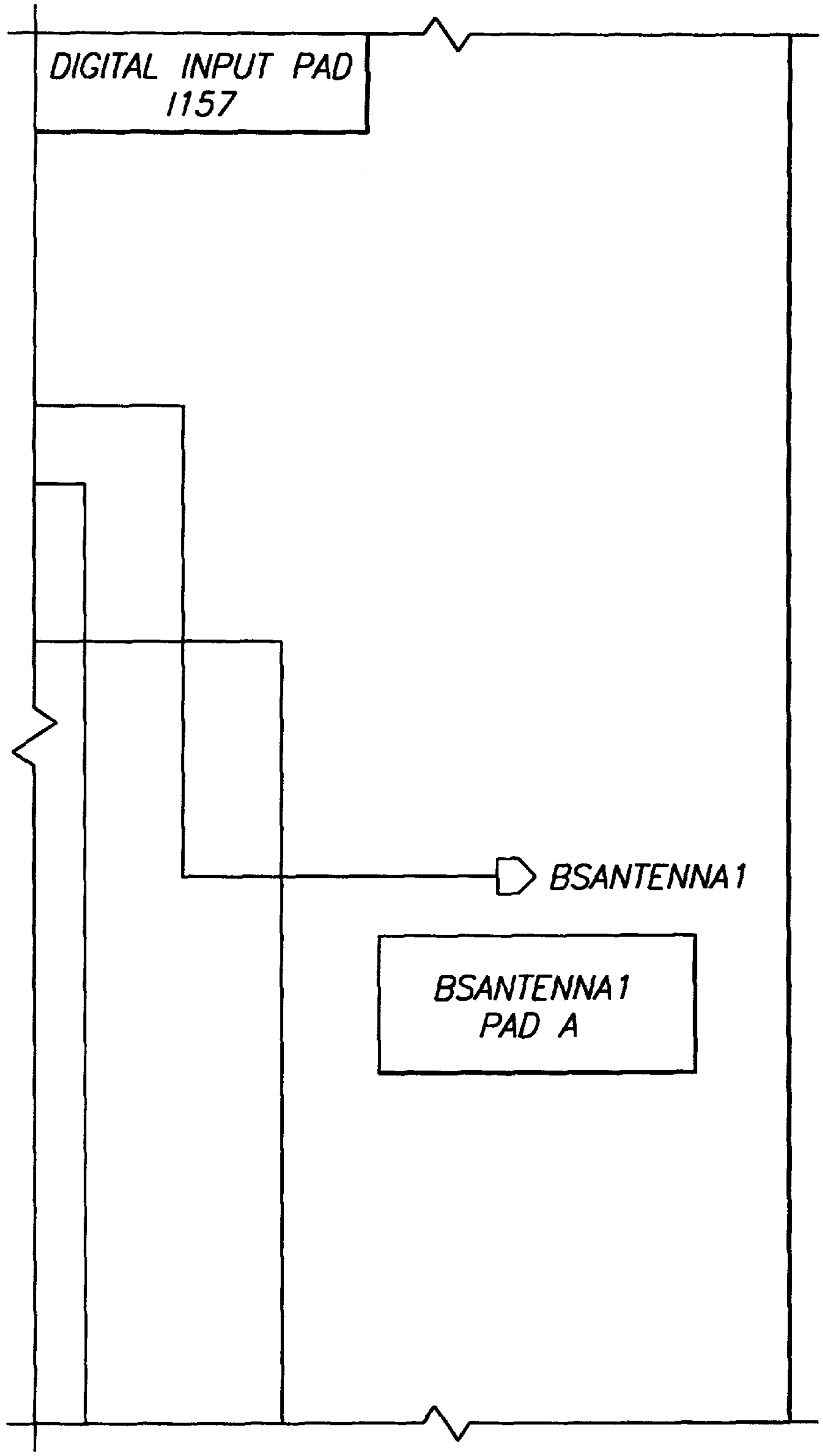
Figure 6C:
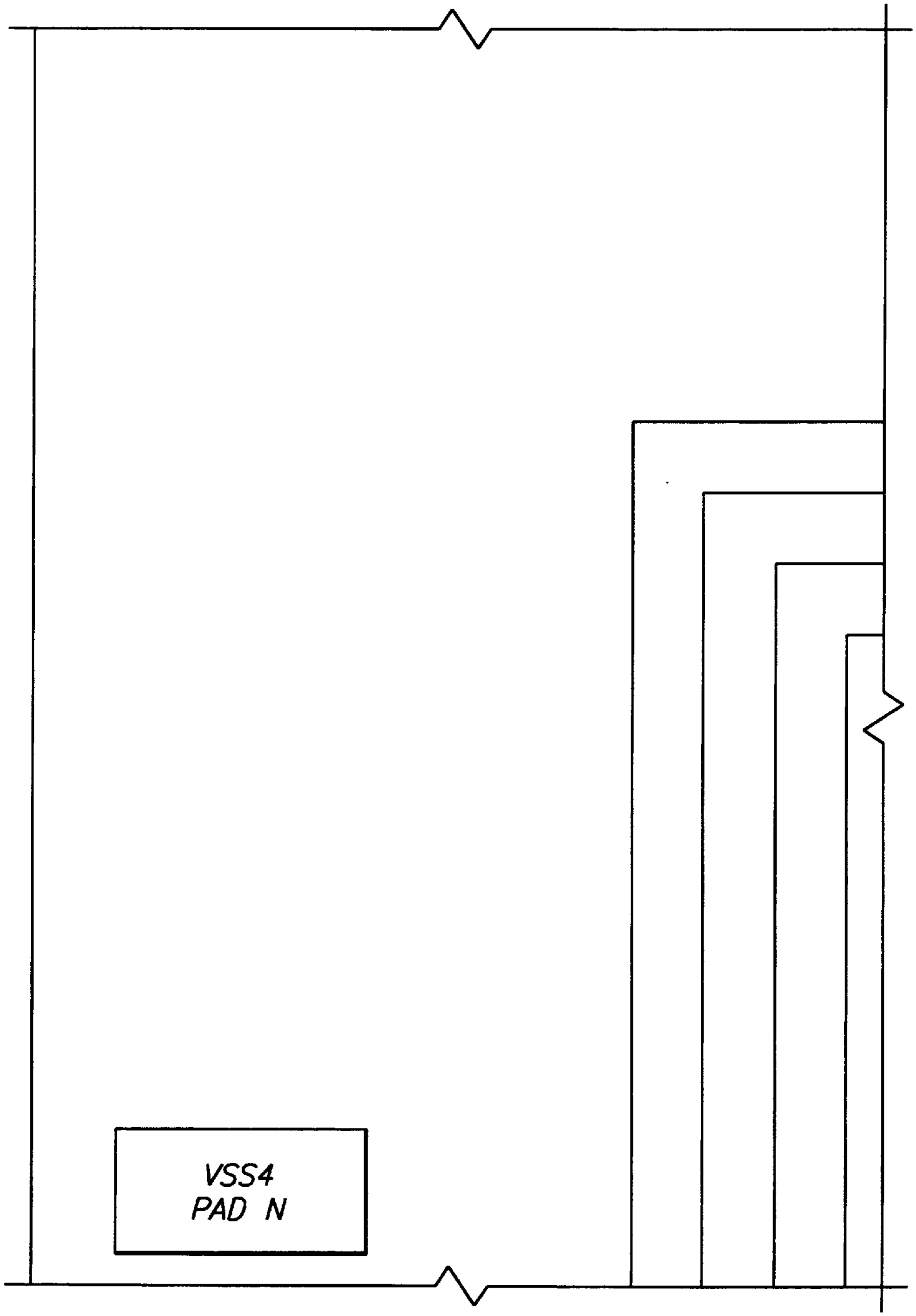
Figure 6C:
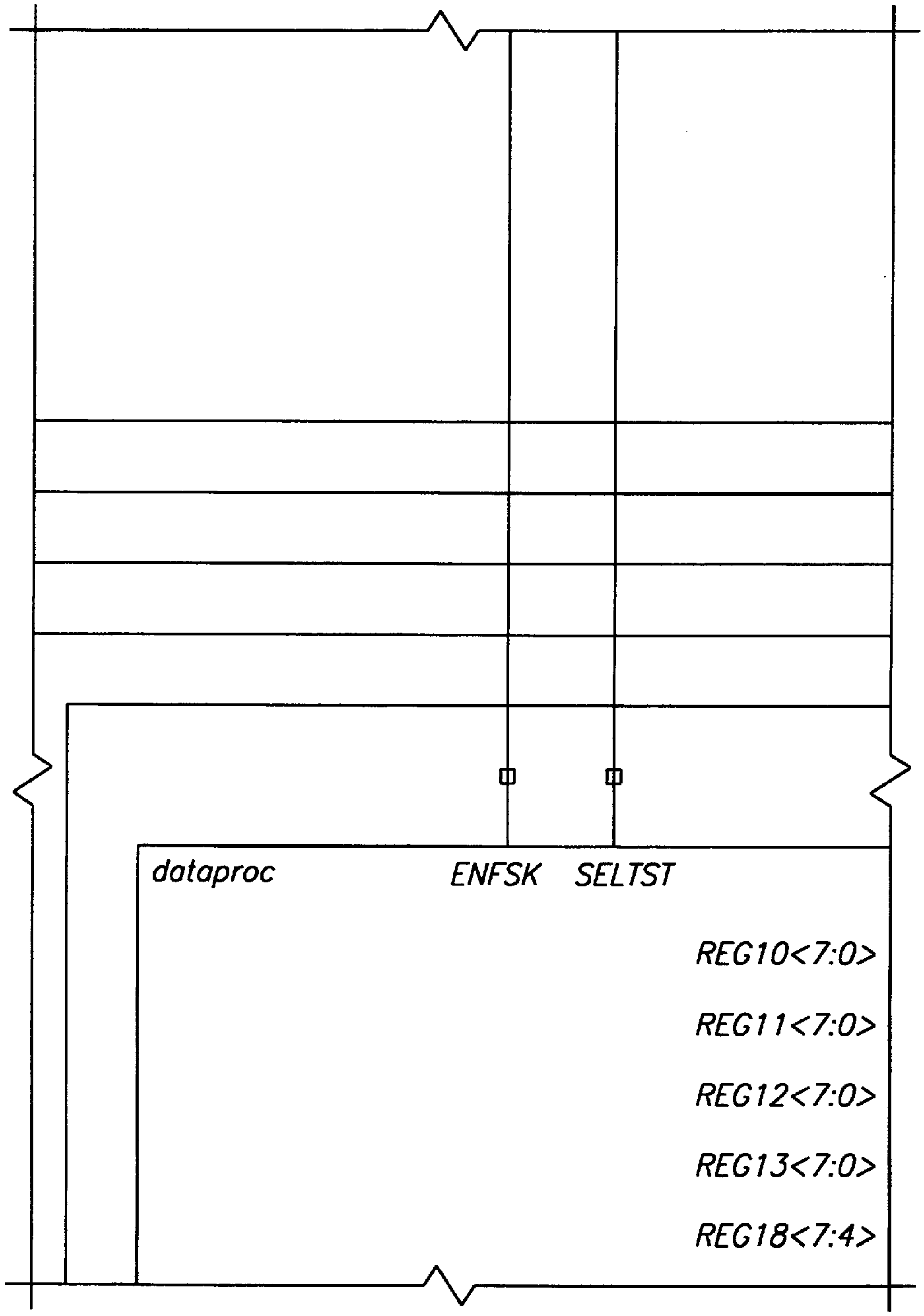
Figure 6C:
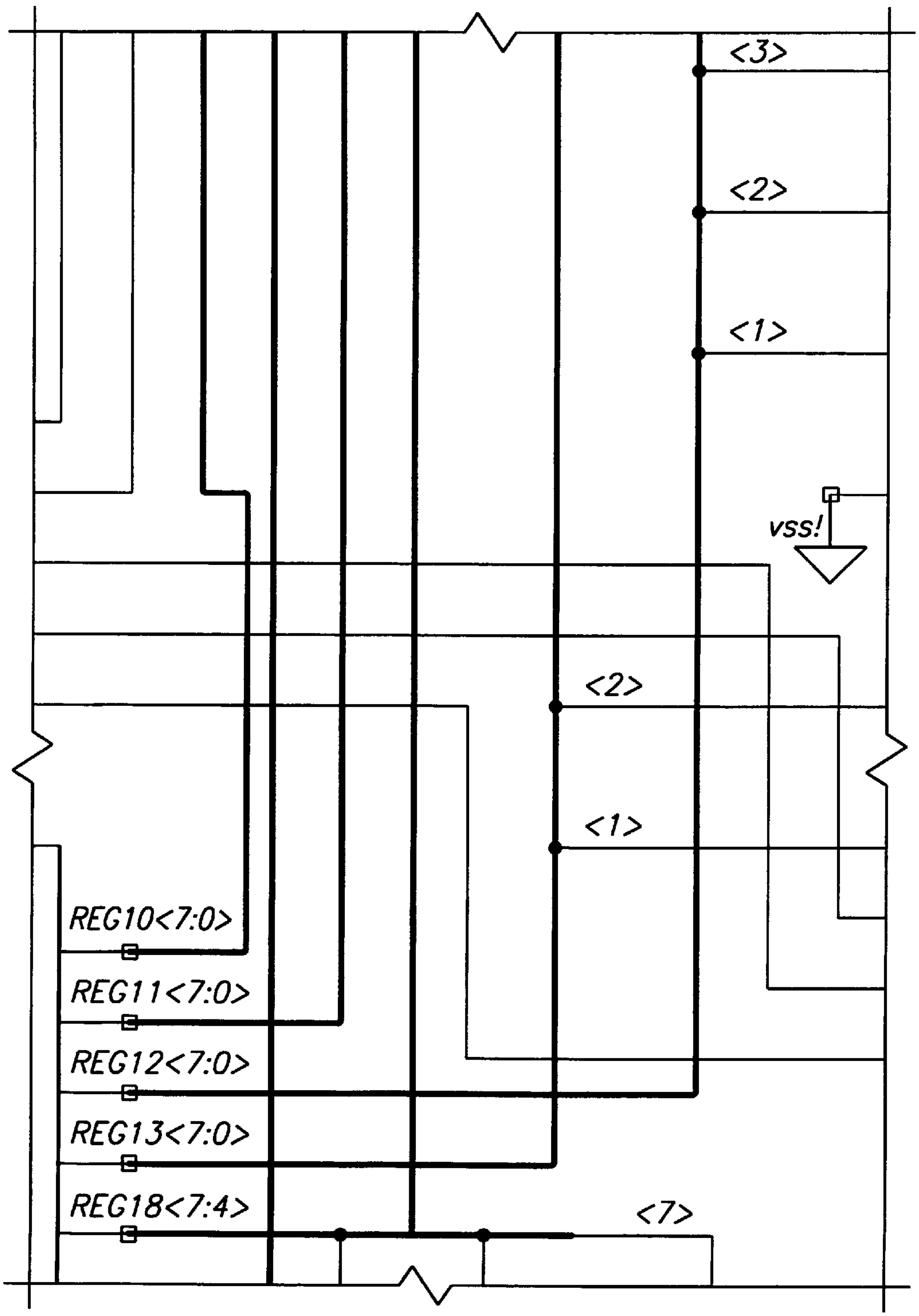
Figure 6C:
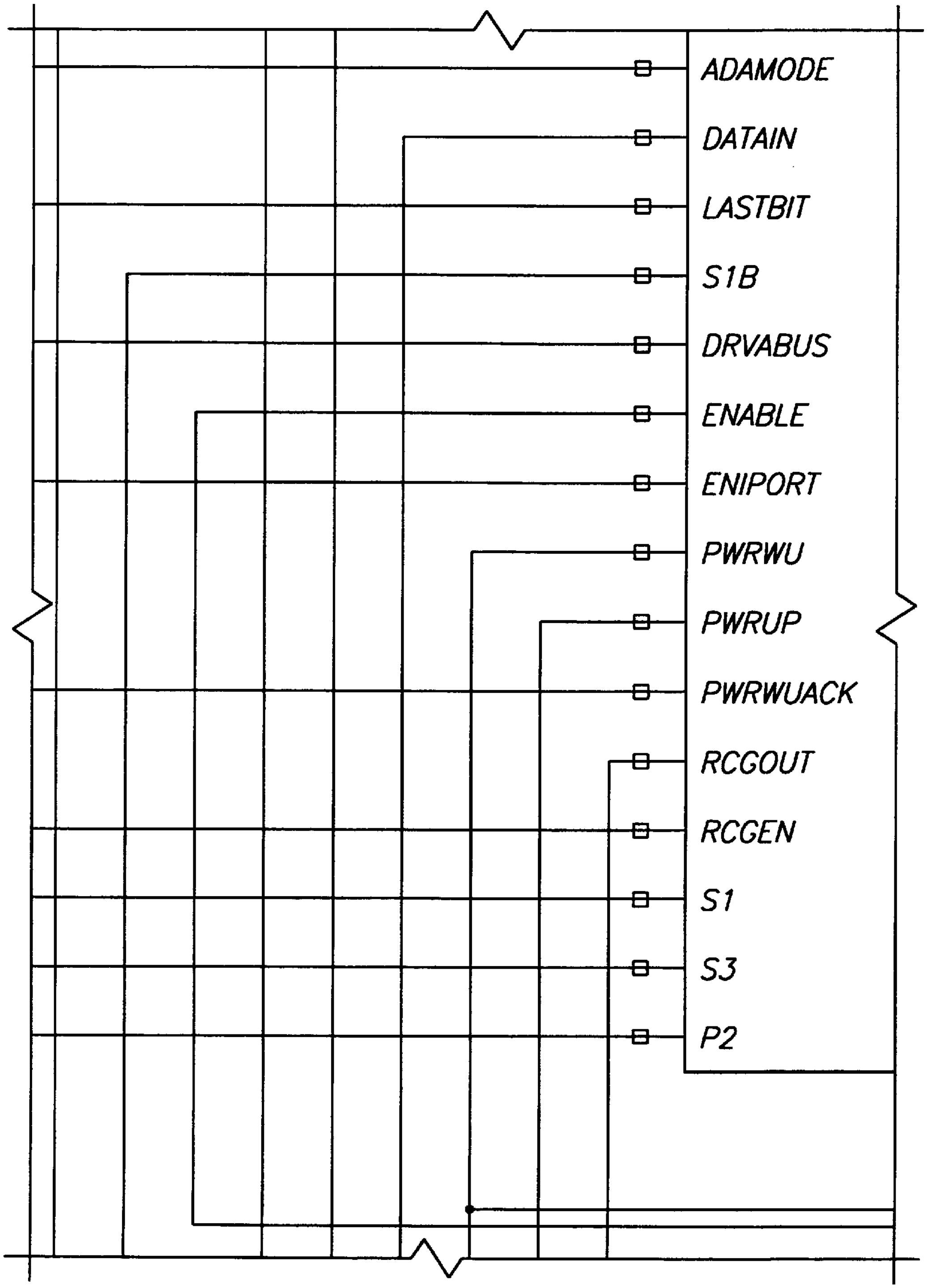
Figure 6C:
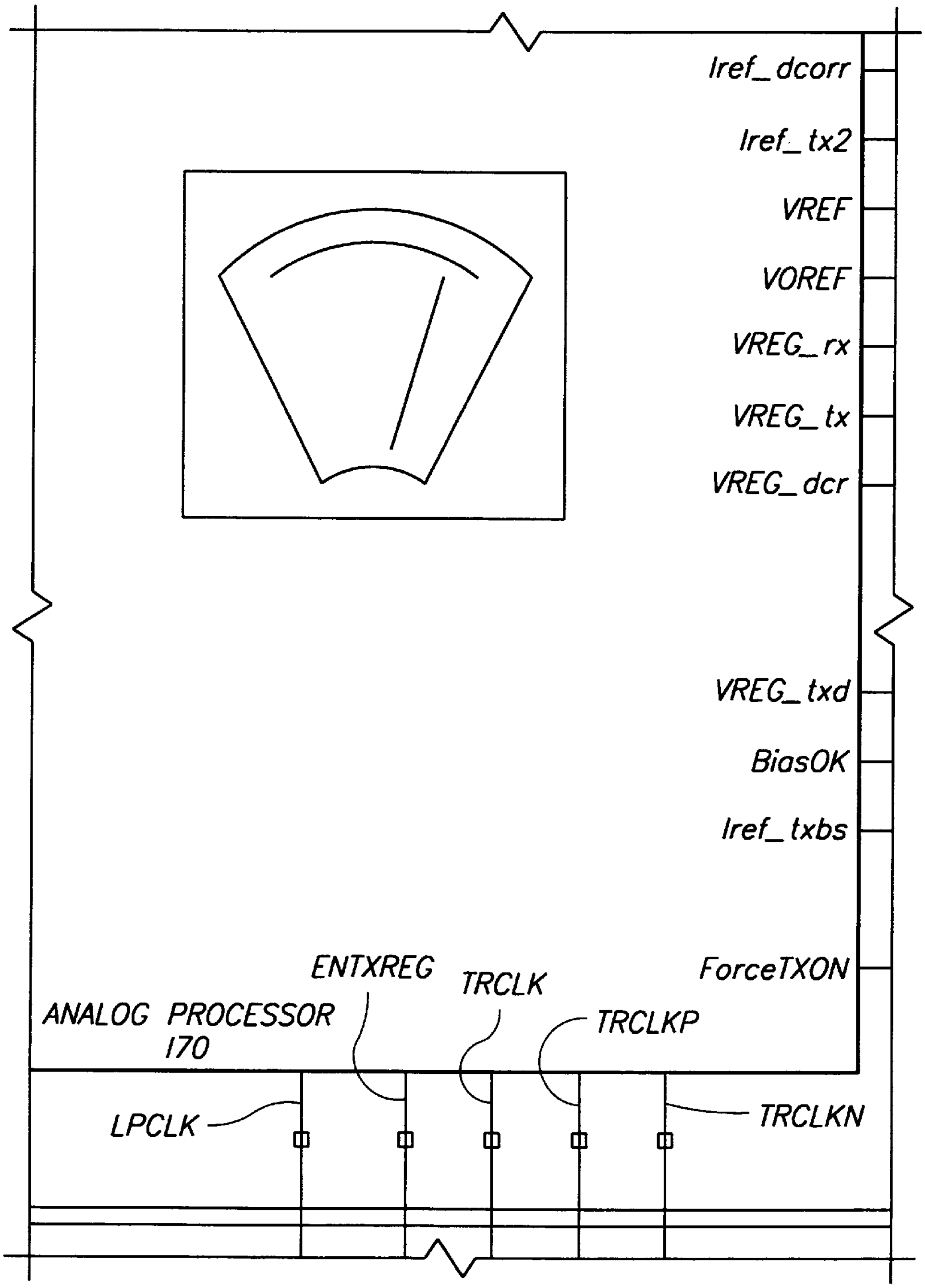
Figure 6C:
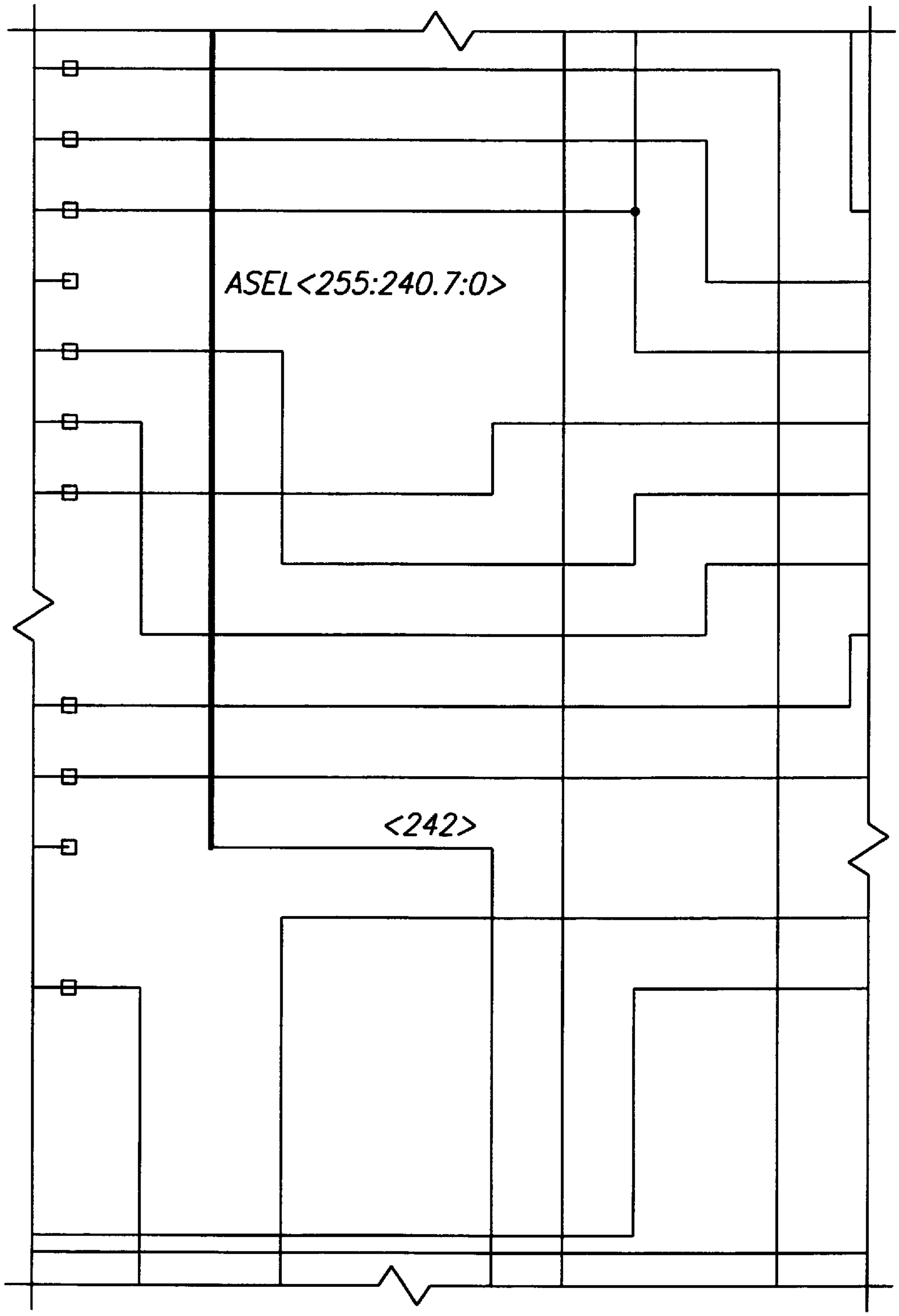
Figure 6C:
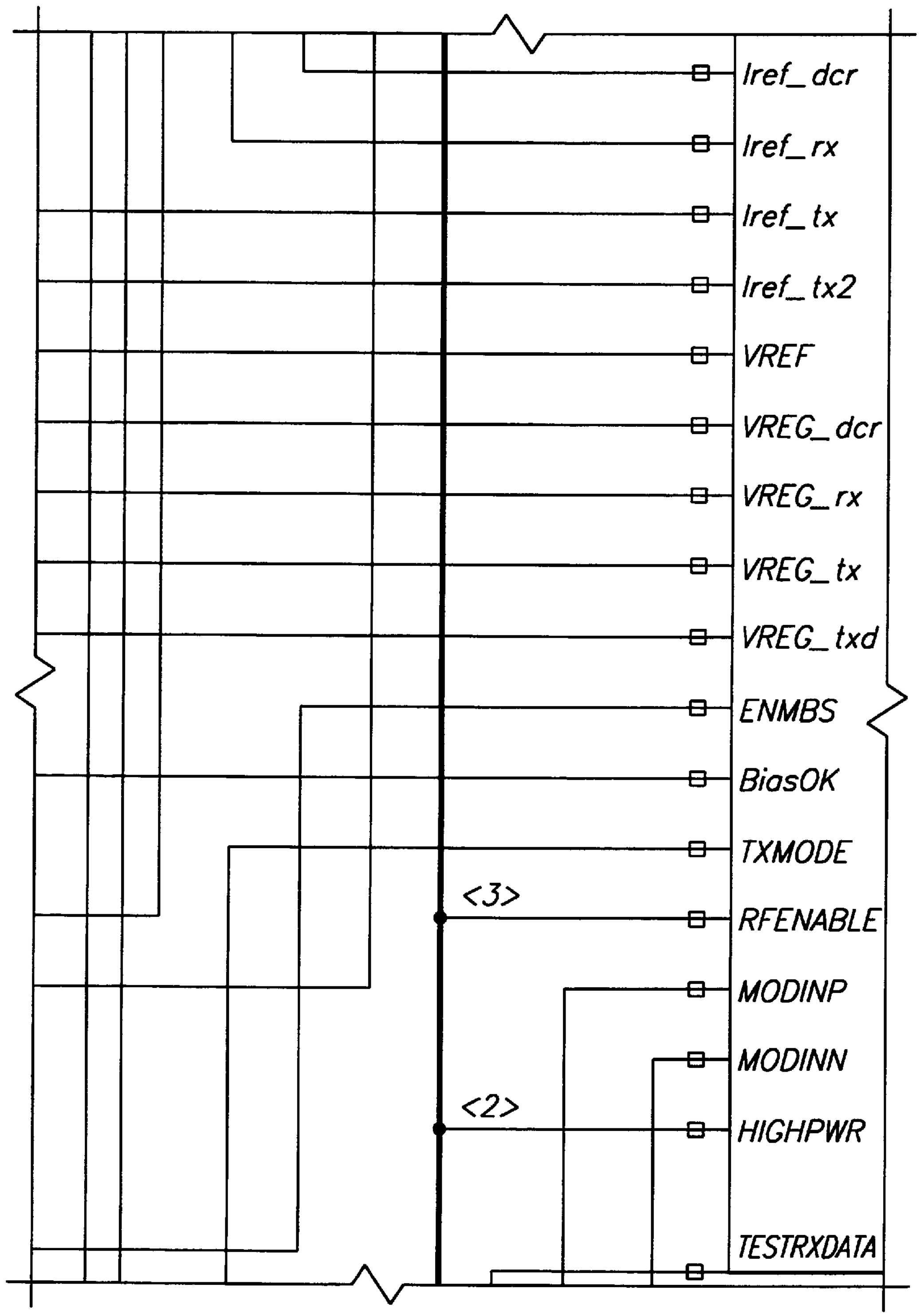
Figure 6C:
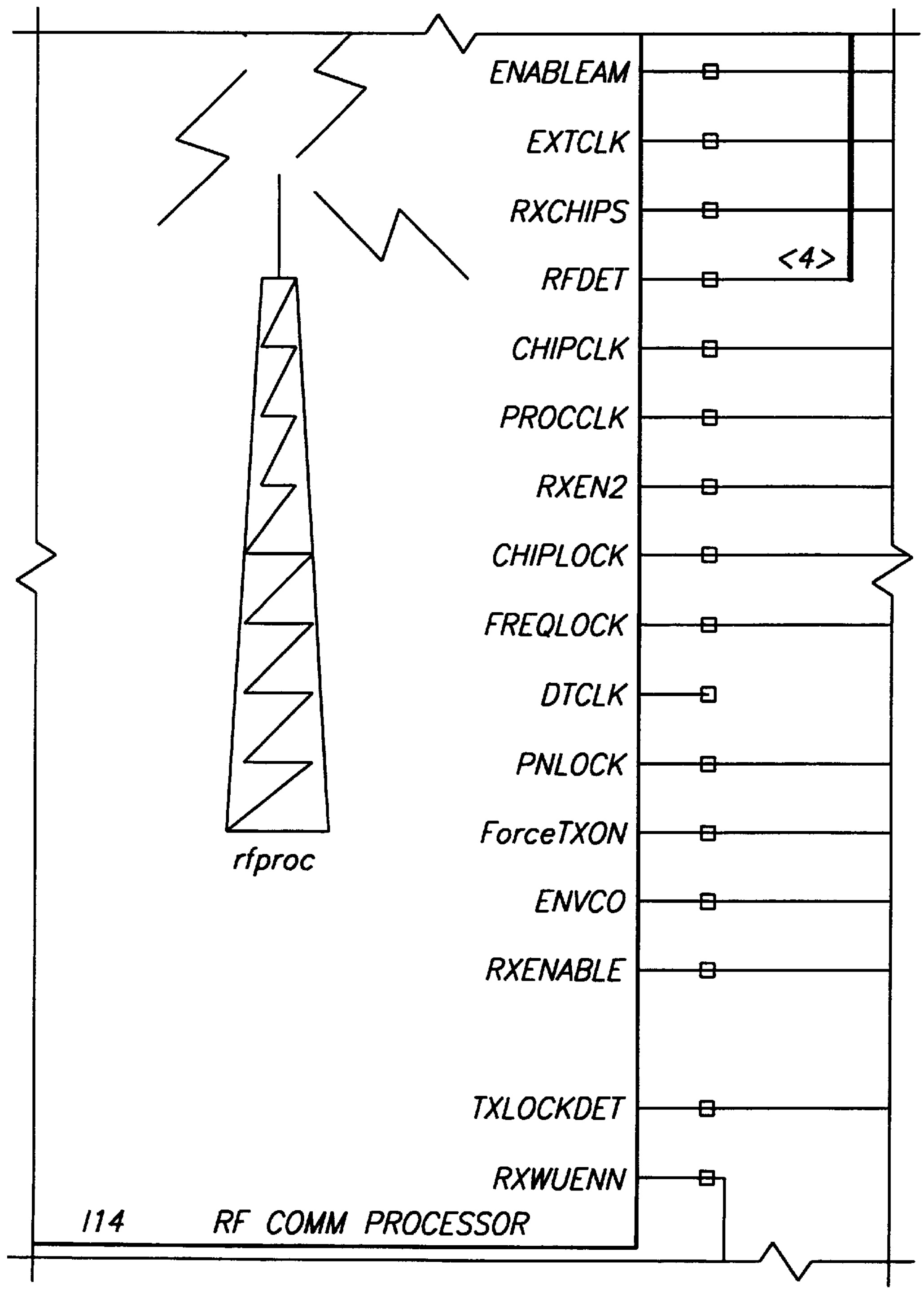
Figure 6C:
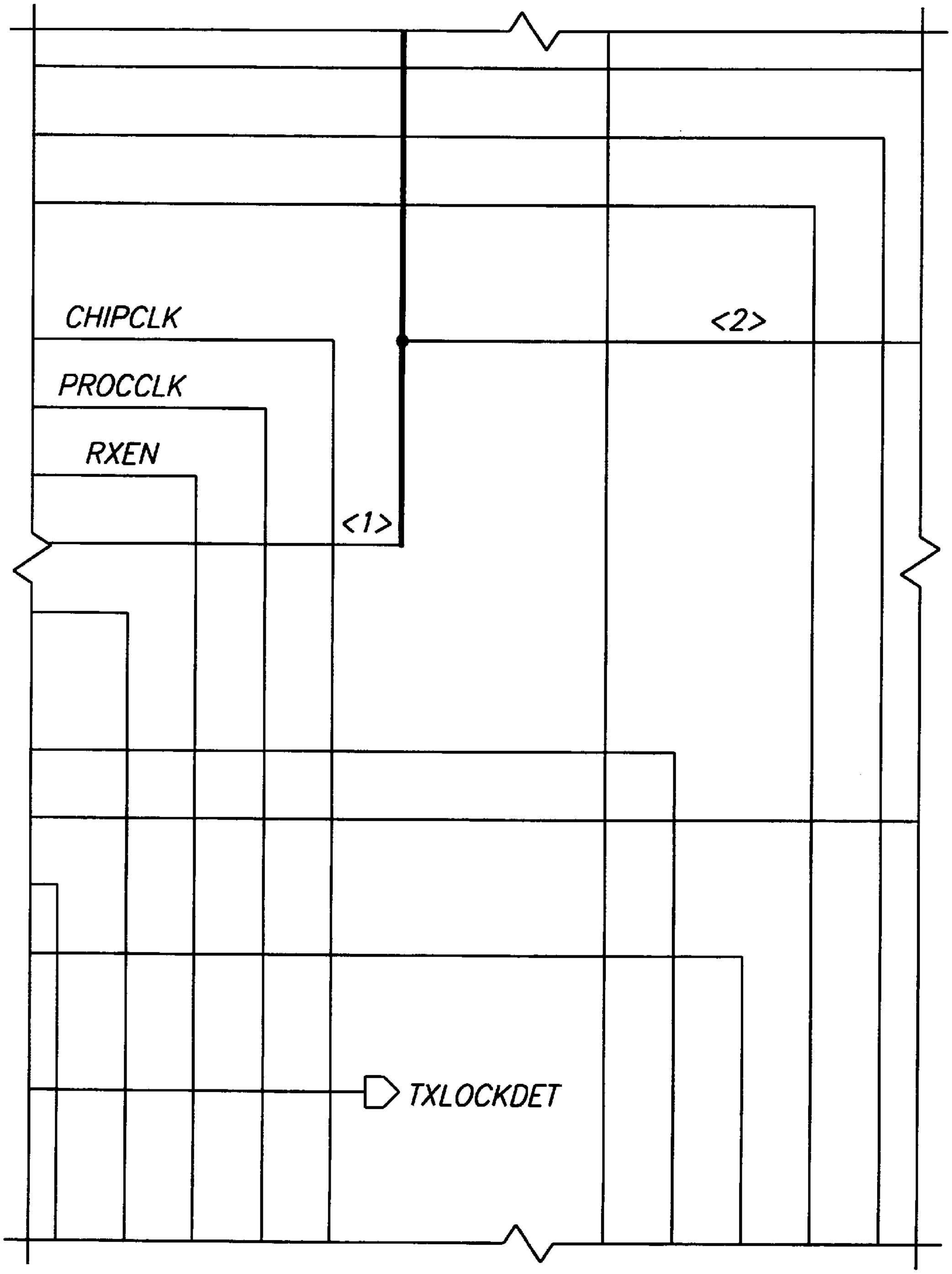
Figure 6C:
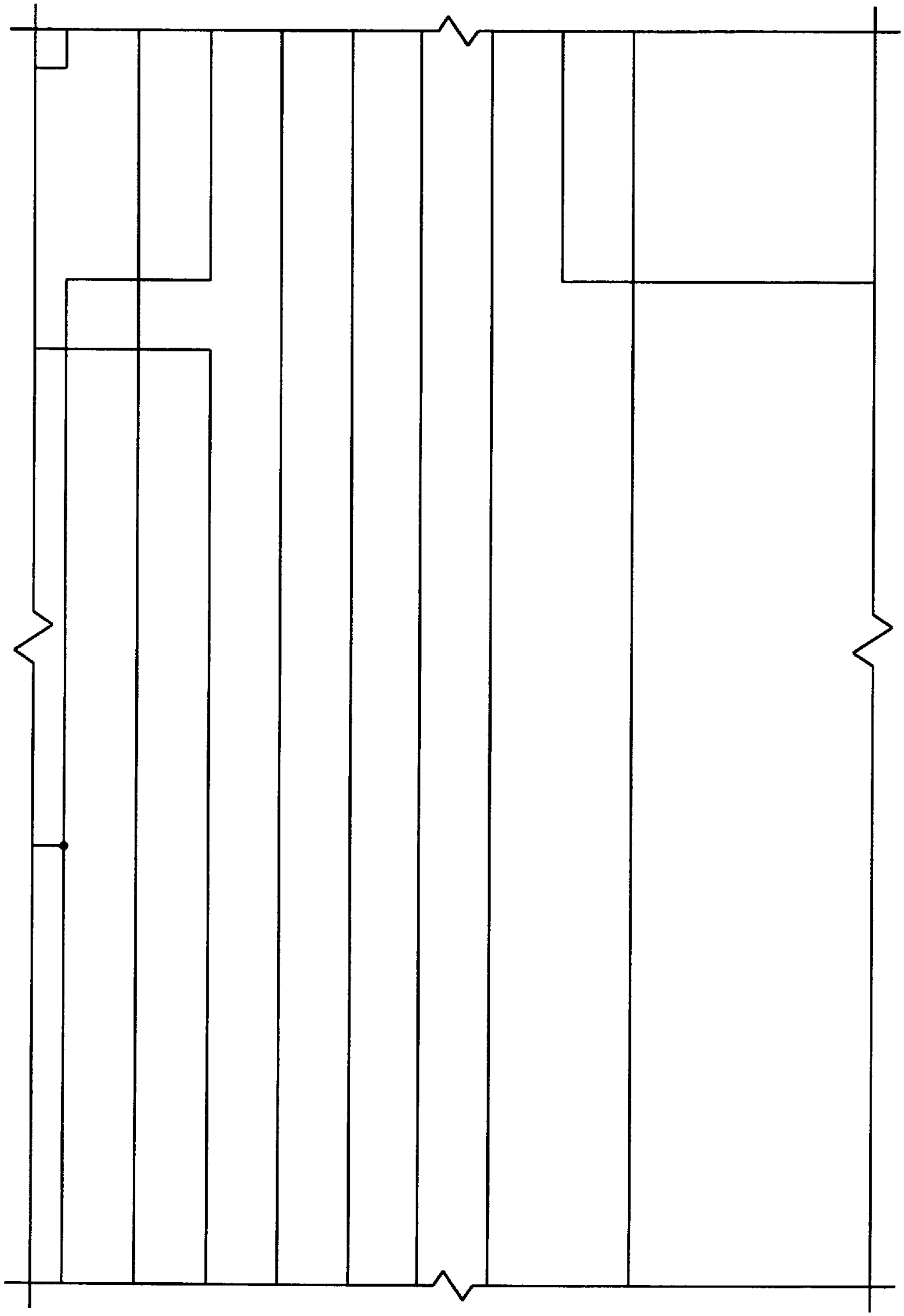
Figure 6C:
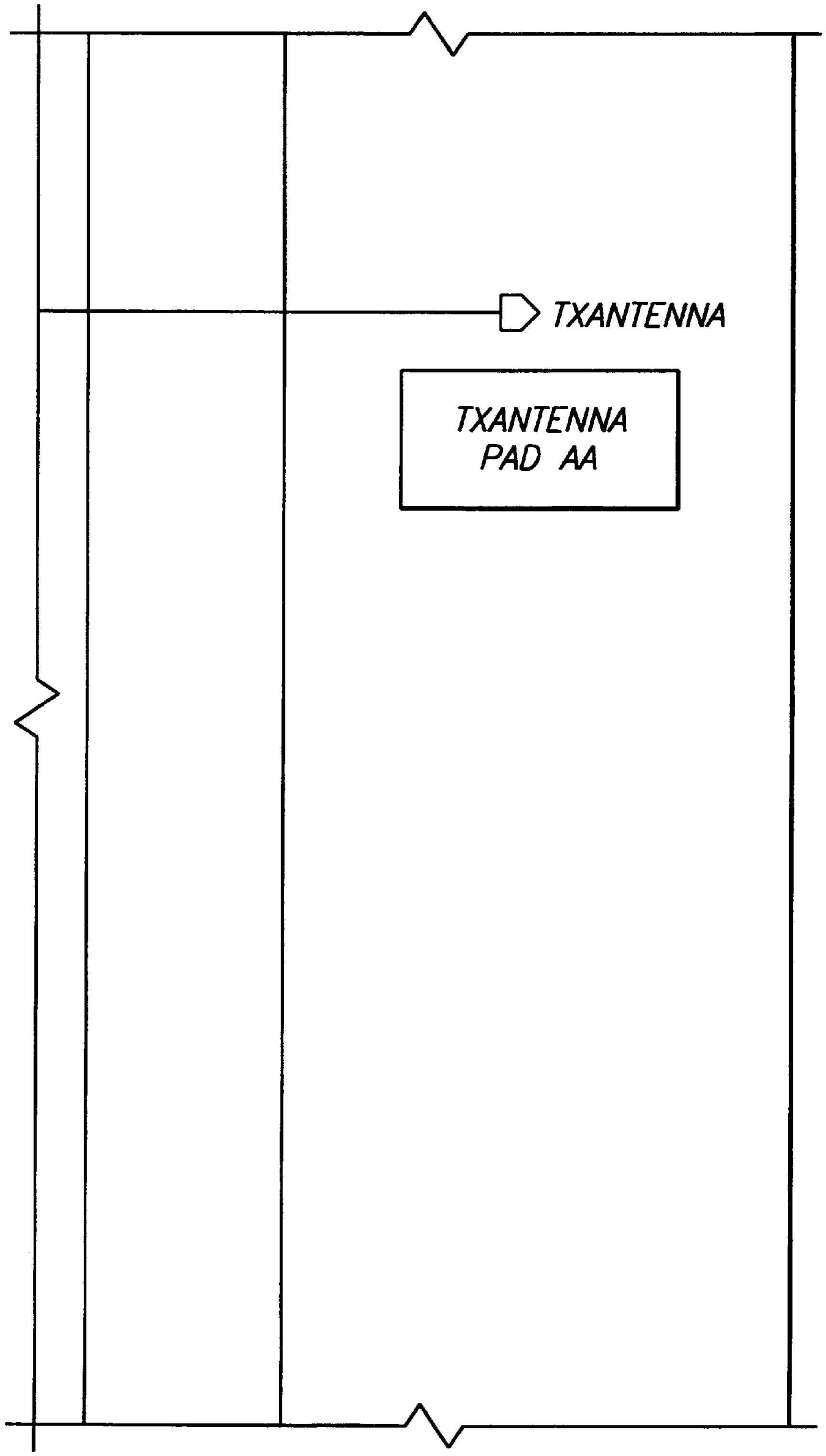
Figure 6D:
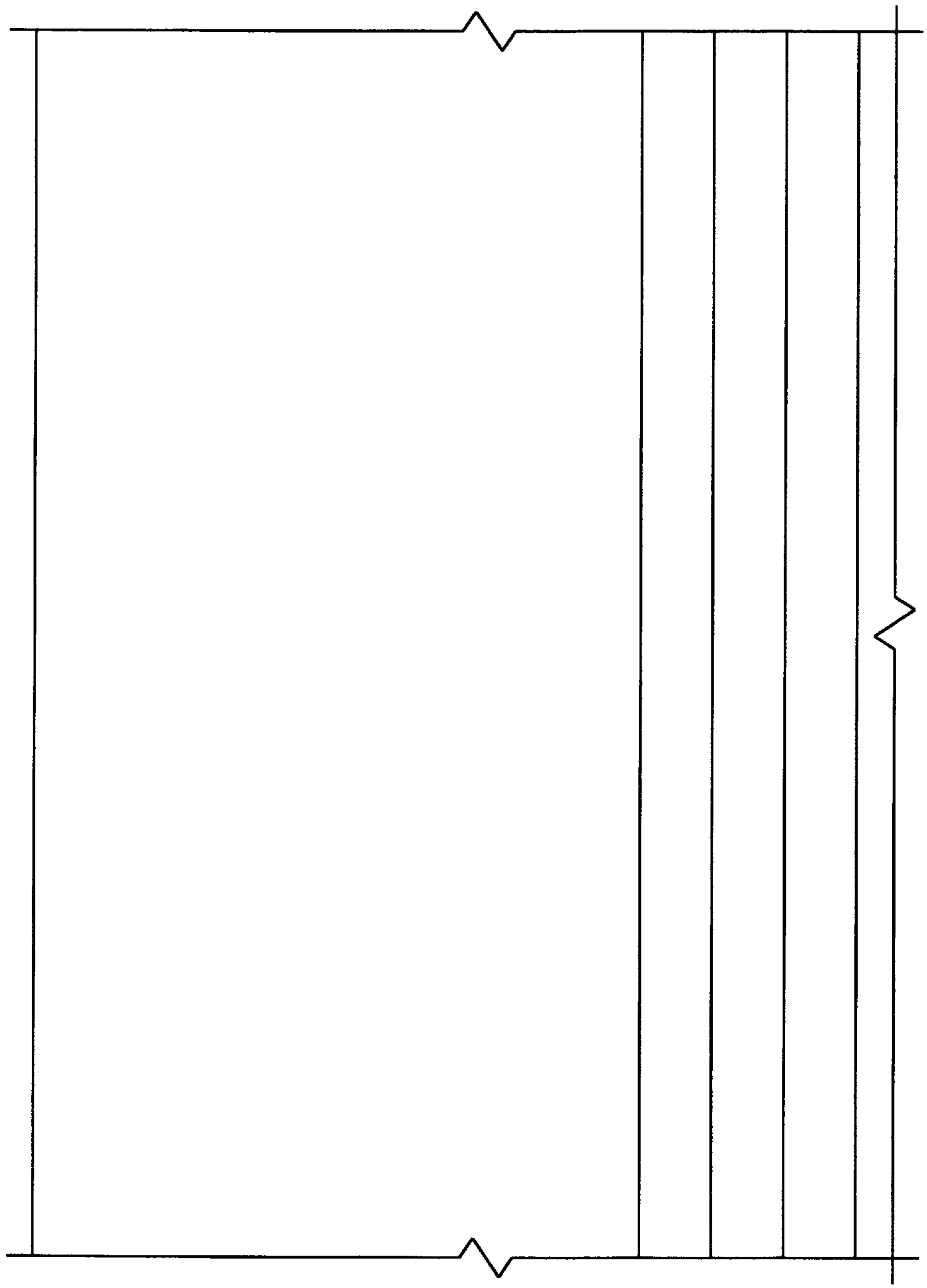
Figure 6D:
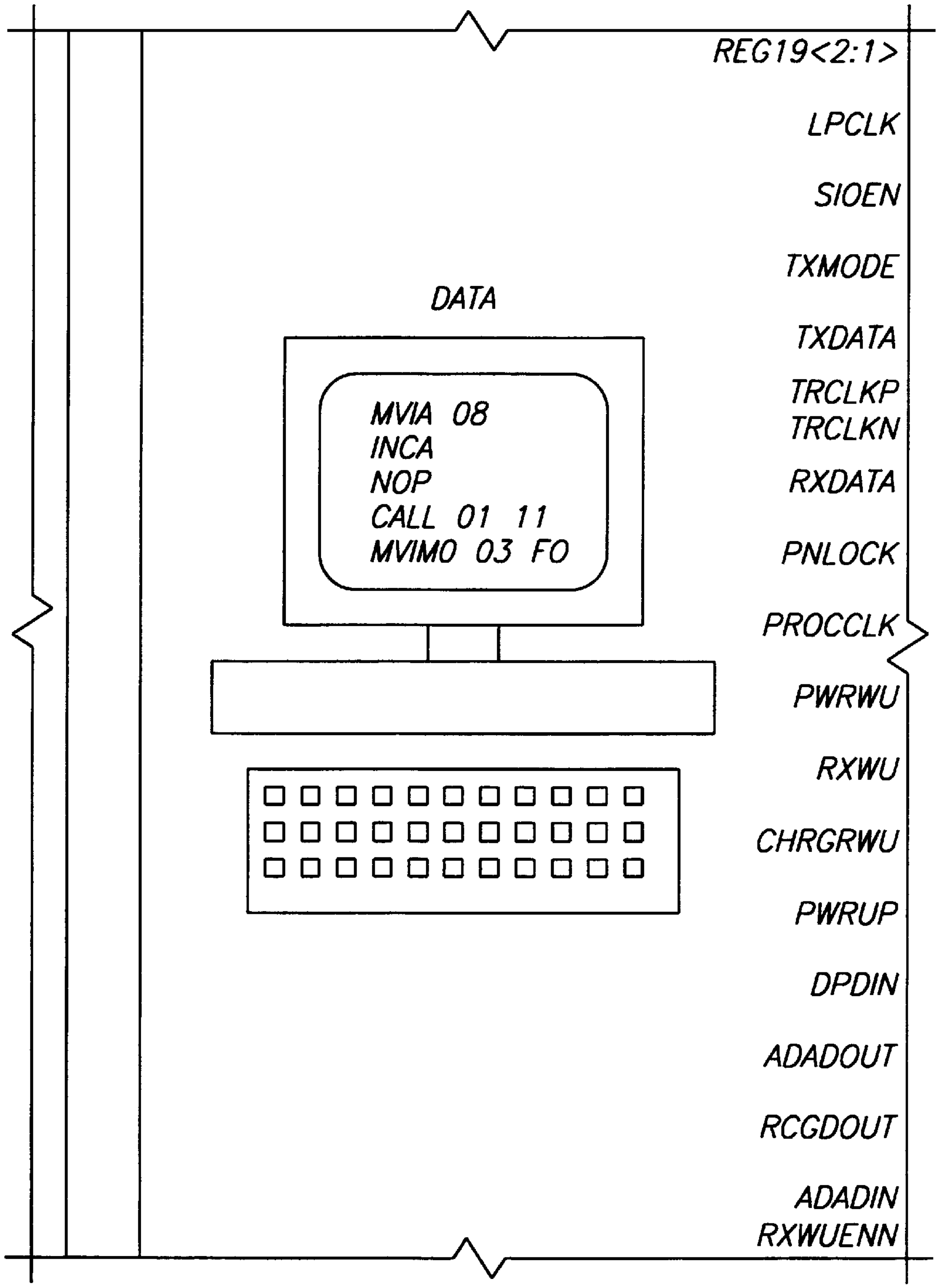
Figure 6D:
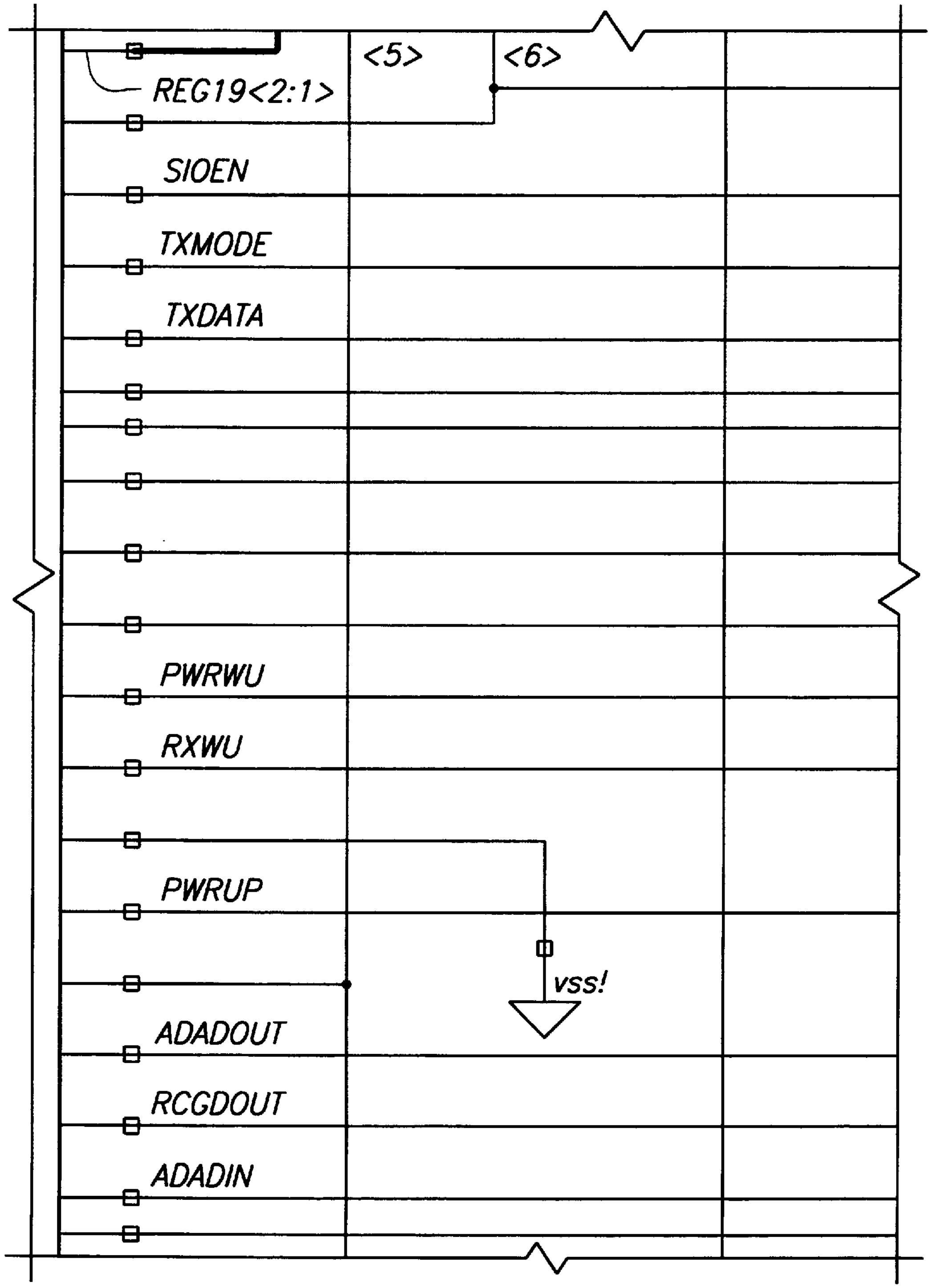
Figure 6D:
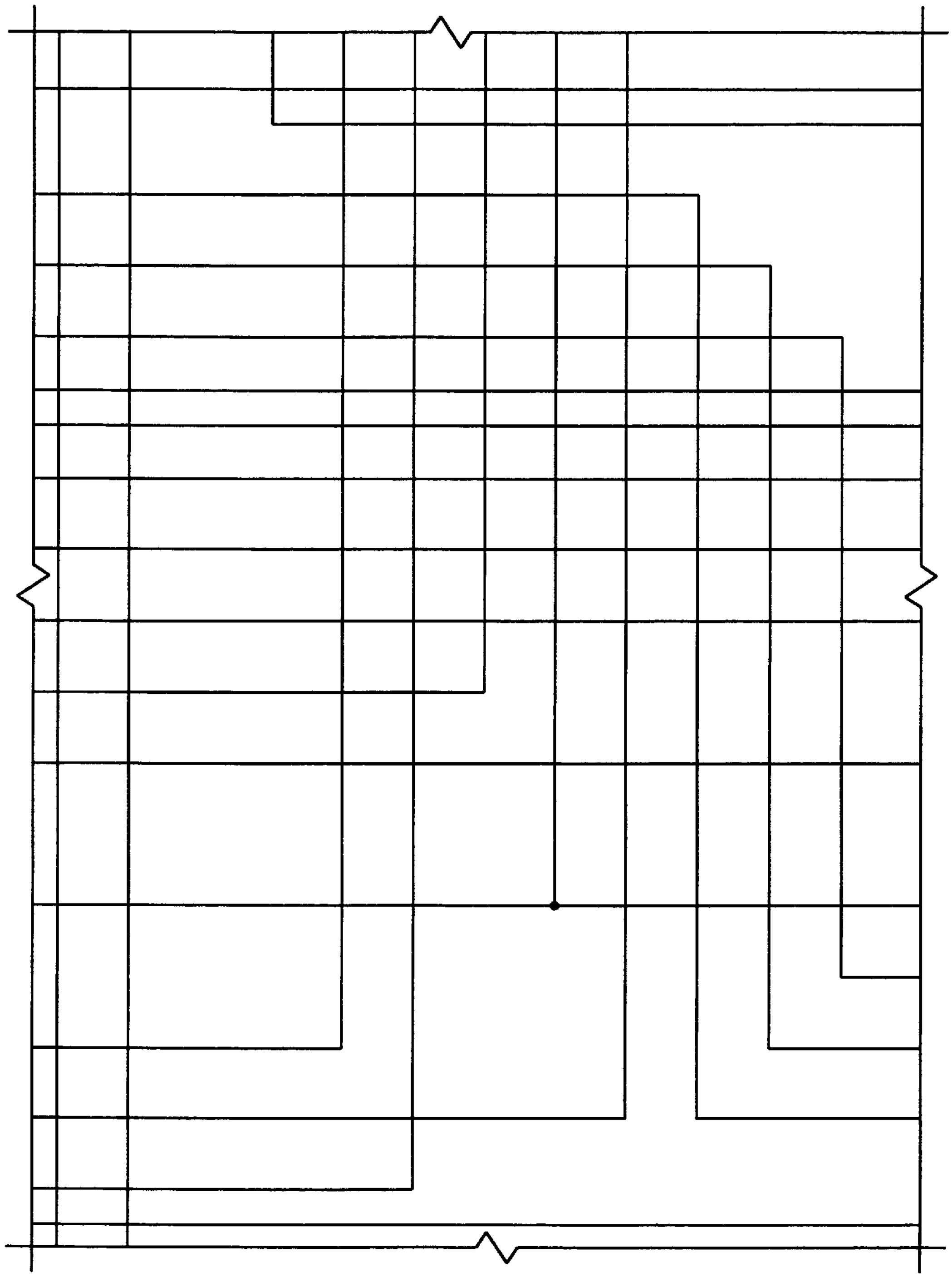
Figure 6D:
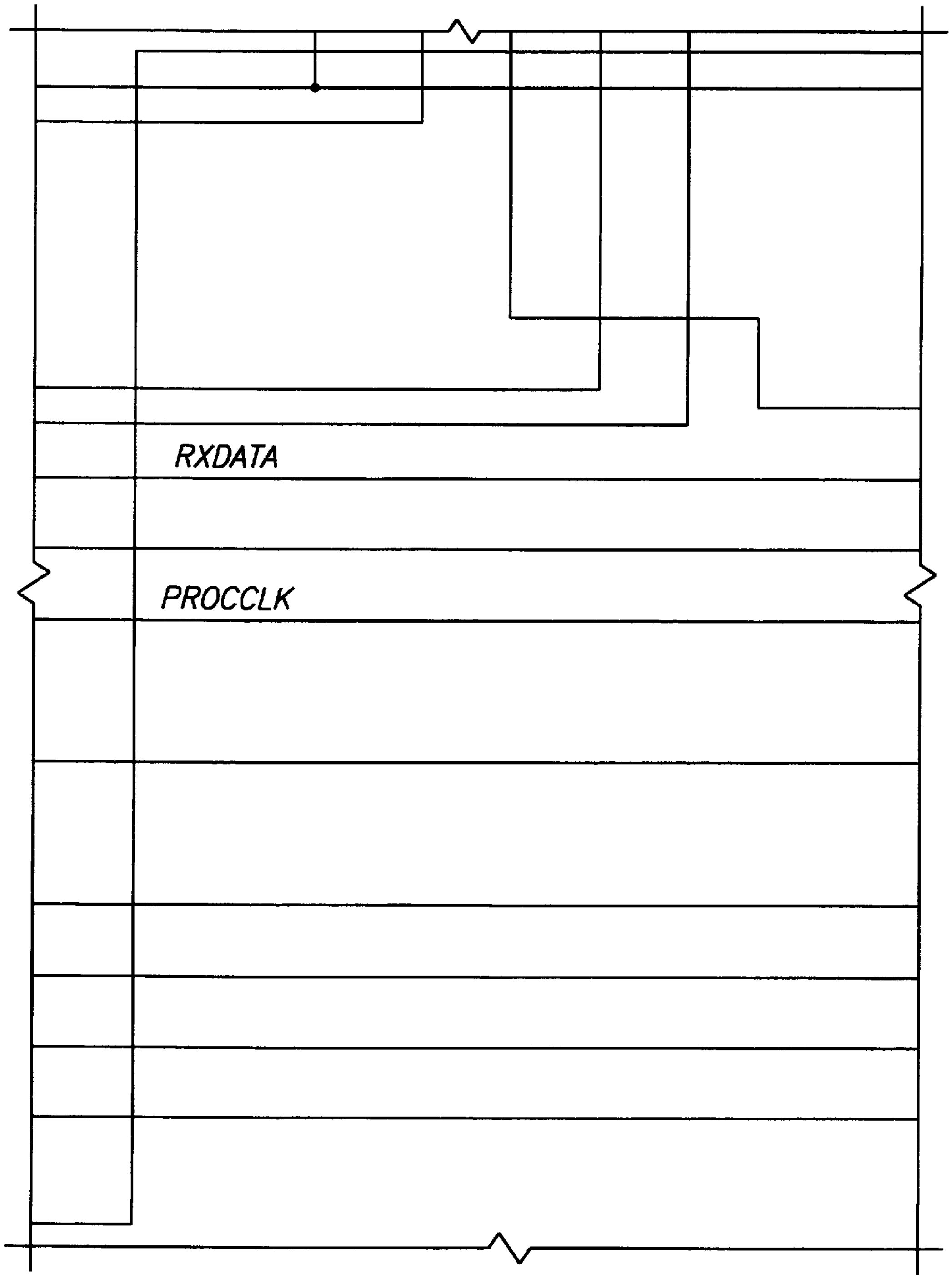
Figure 6D:
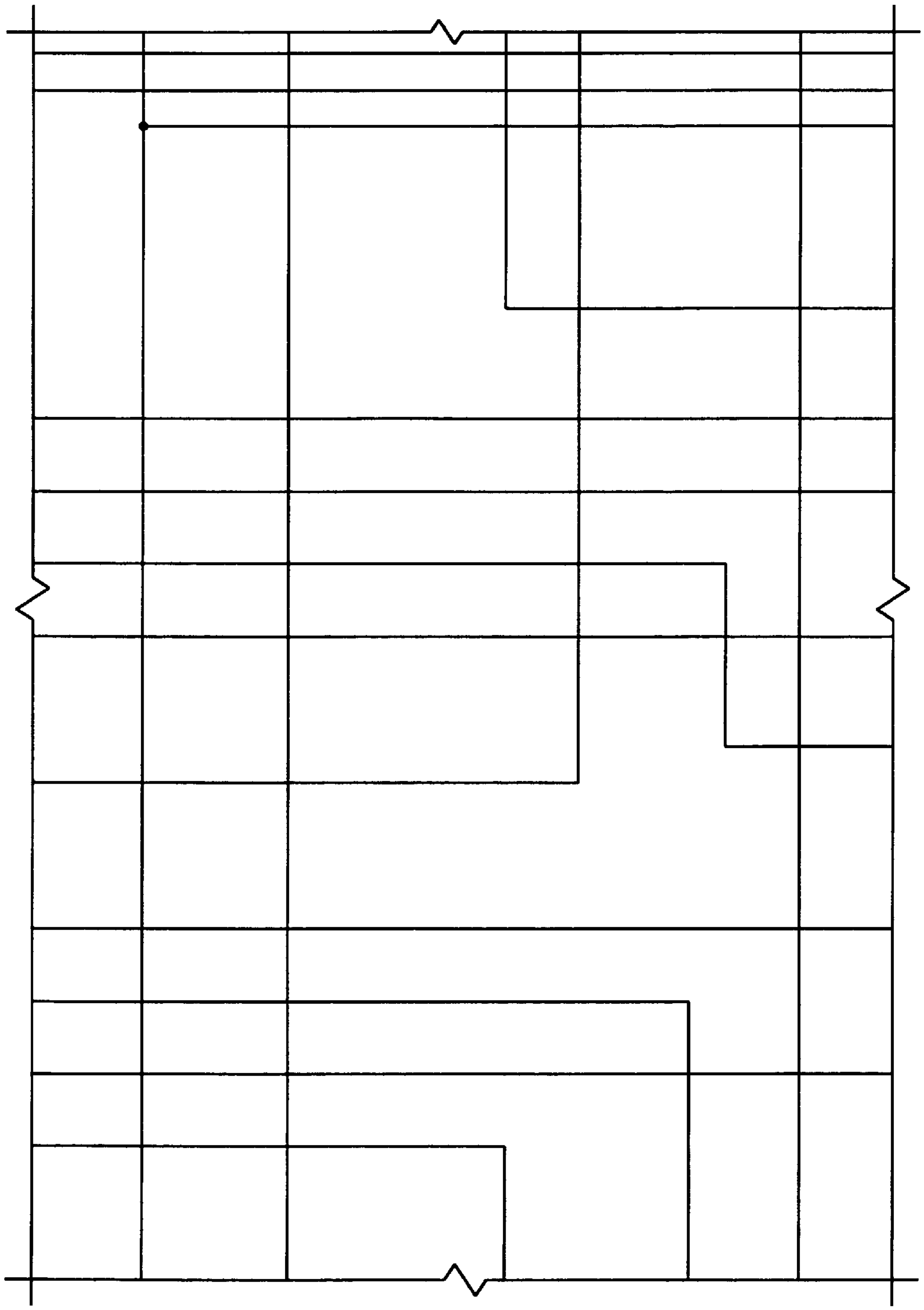
Figure 6D:
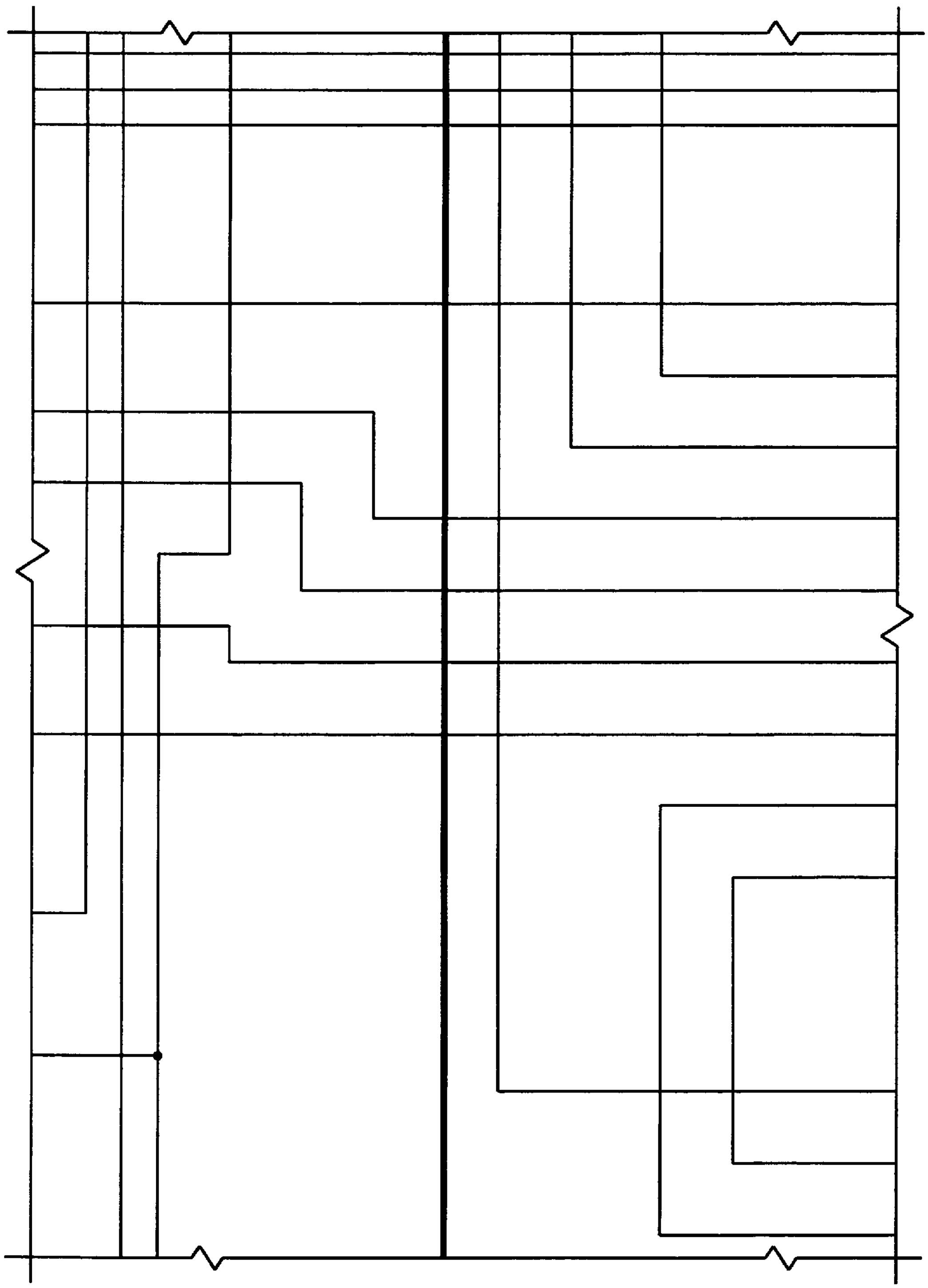
Figure 6D:
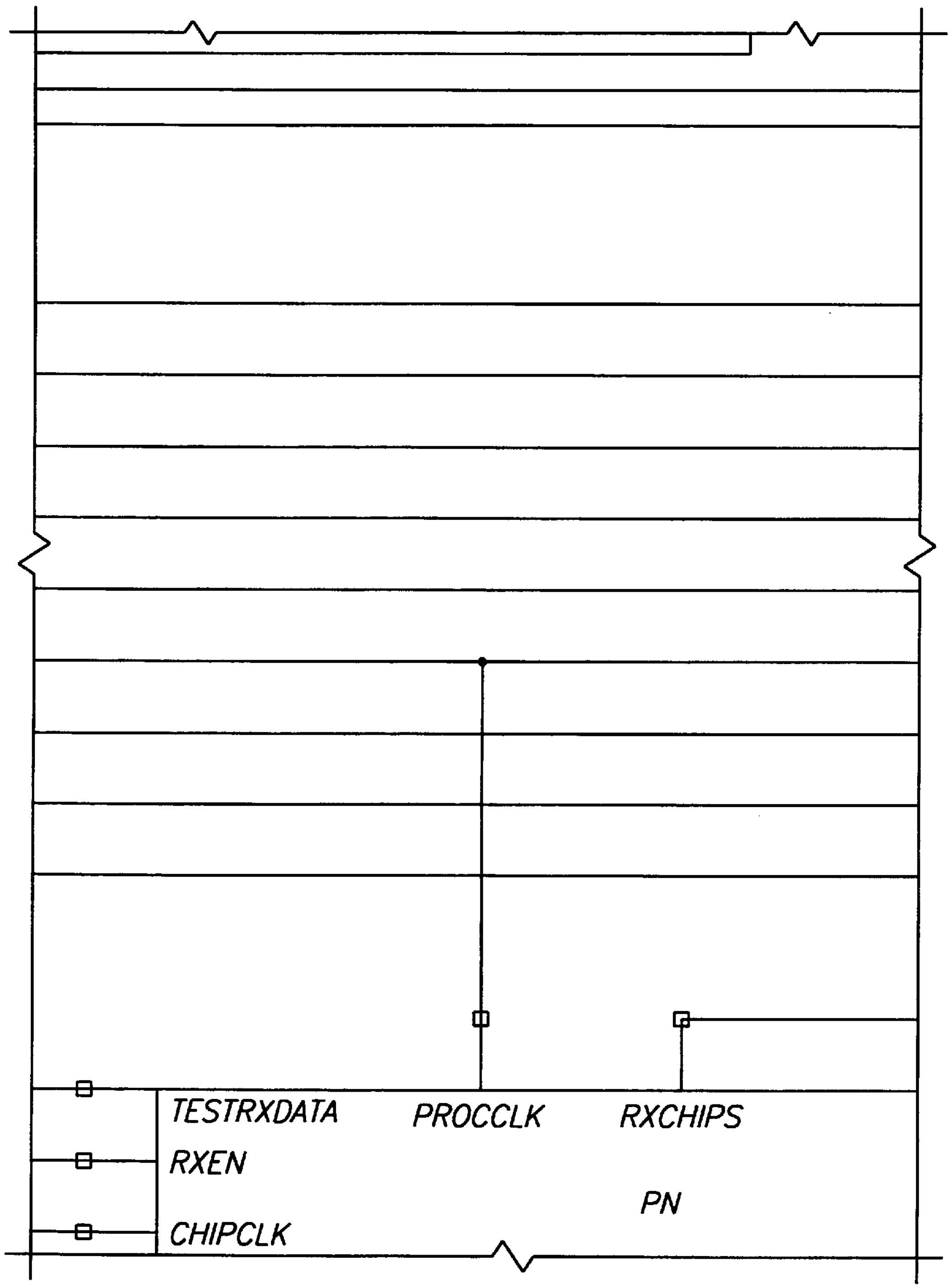
Figure 6D:
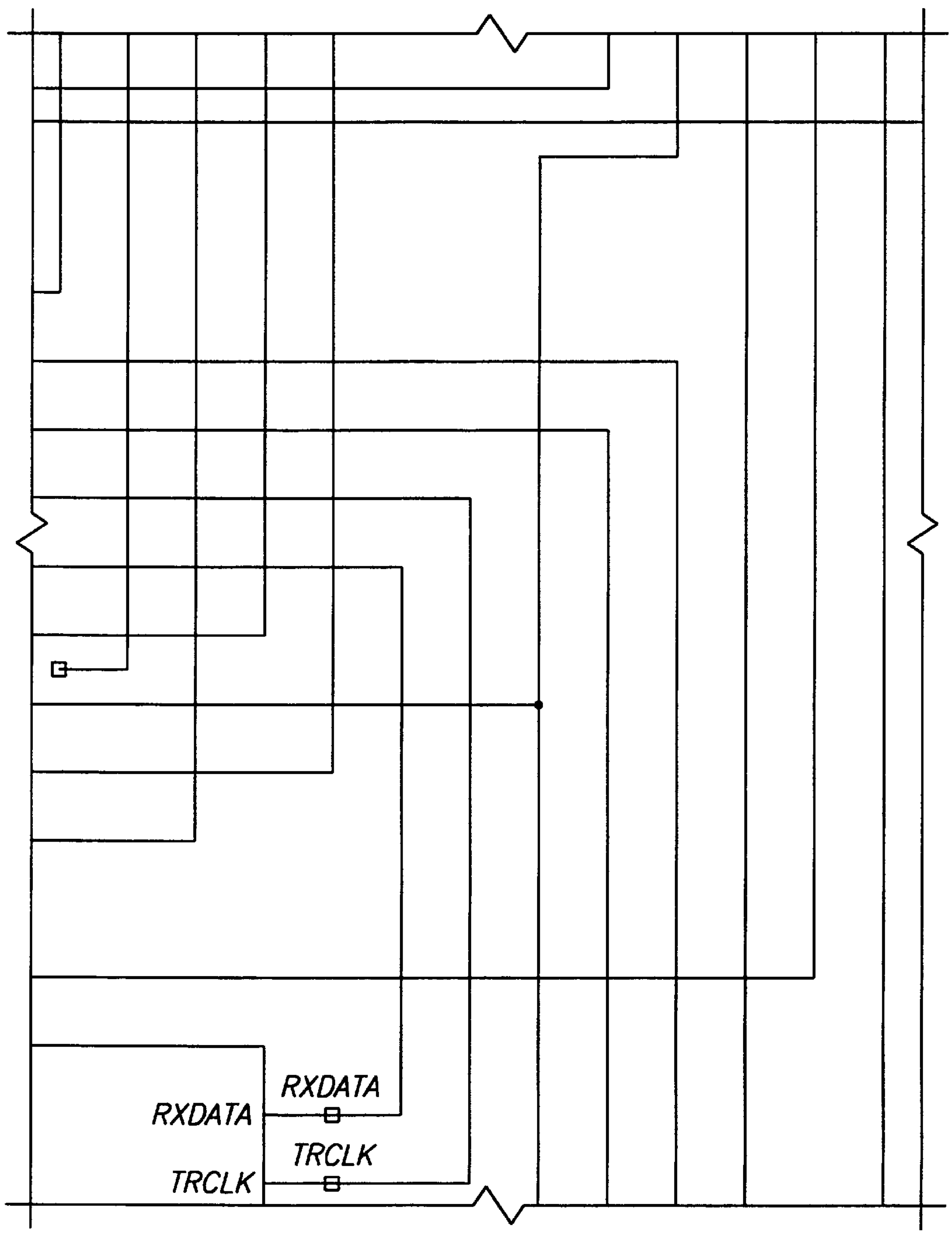
Figure 6D:
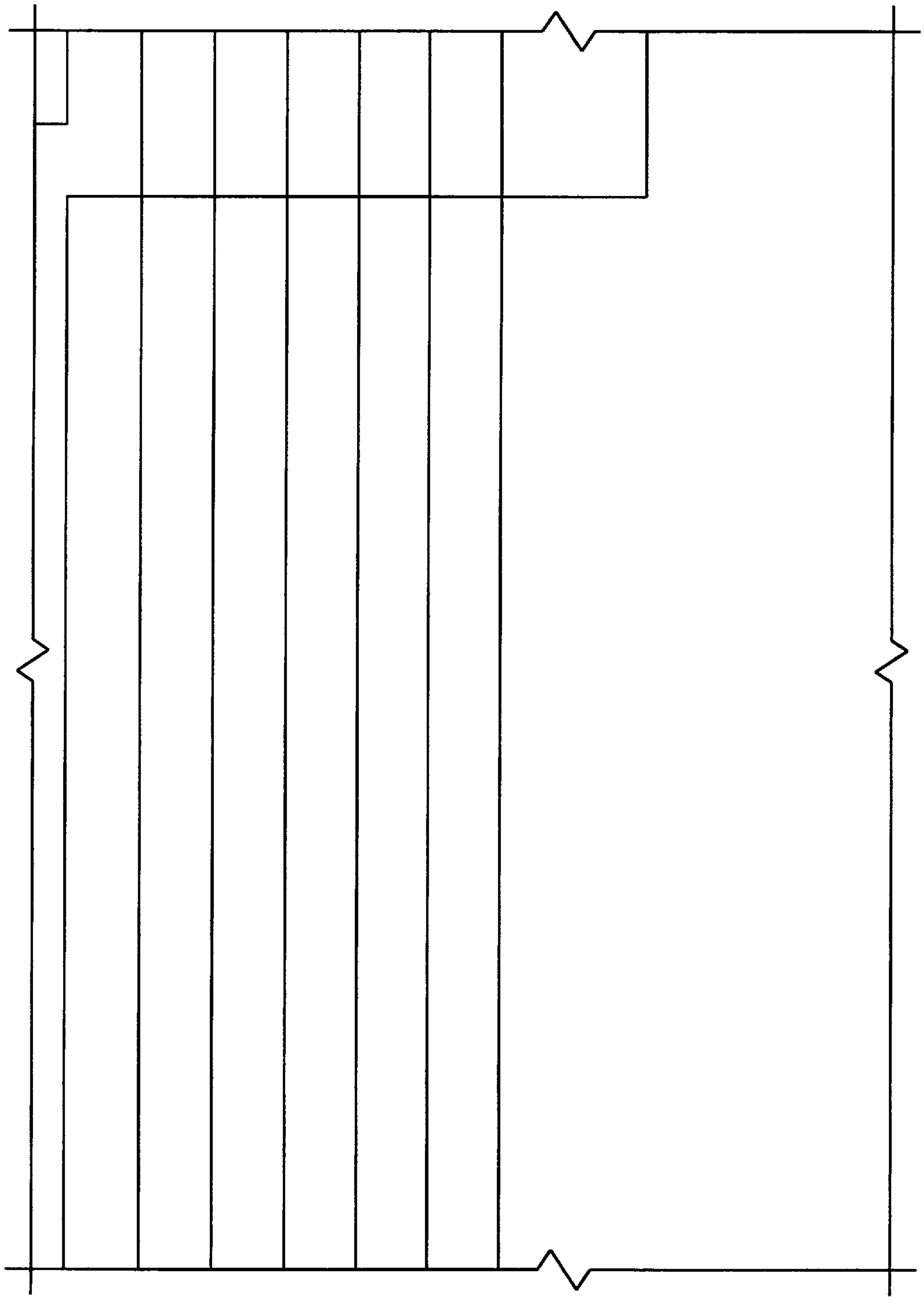
Figure 6D:
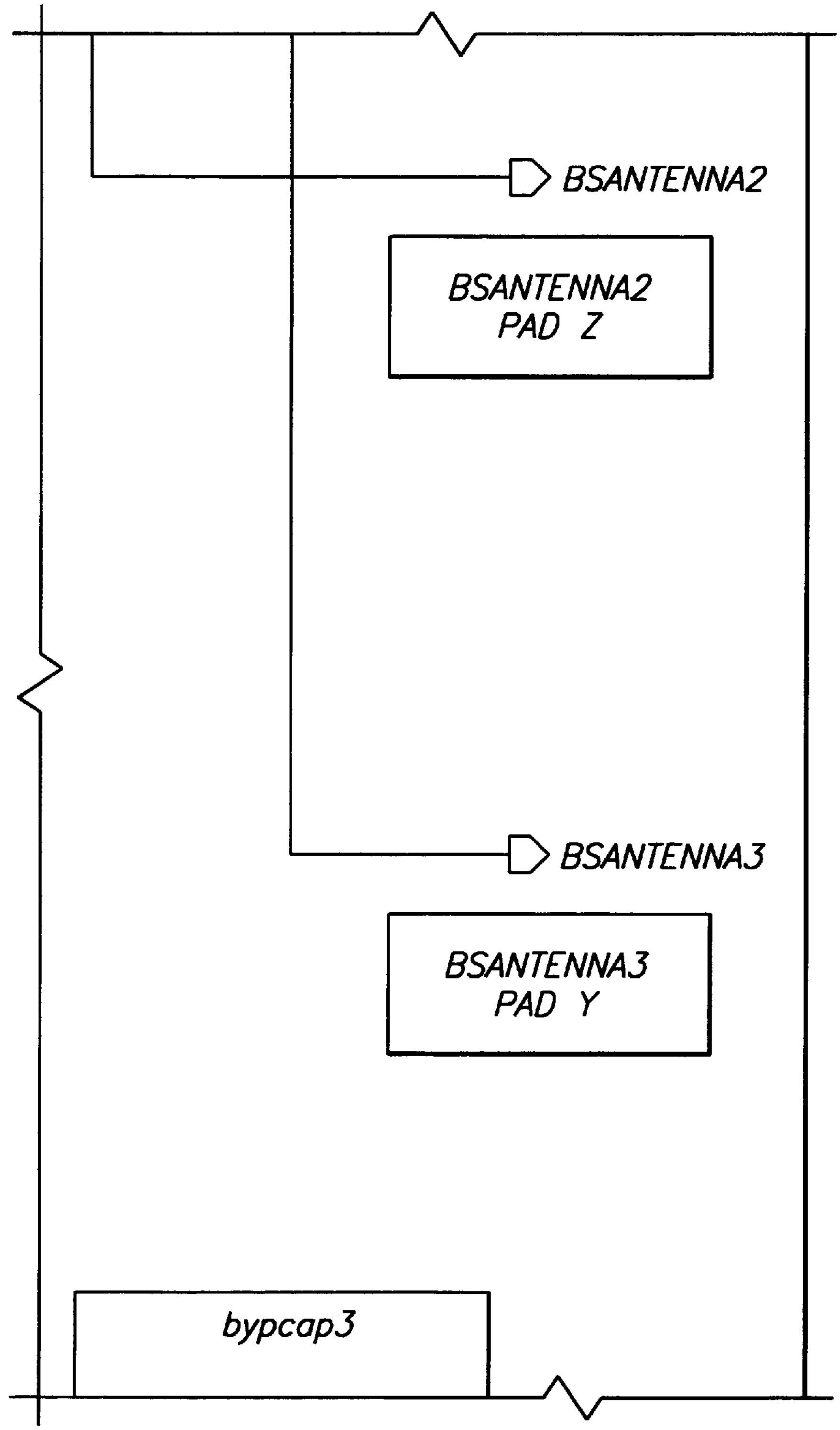
Figure 6E:
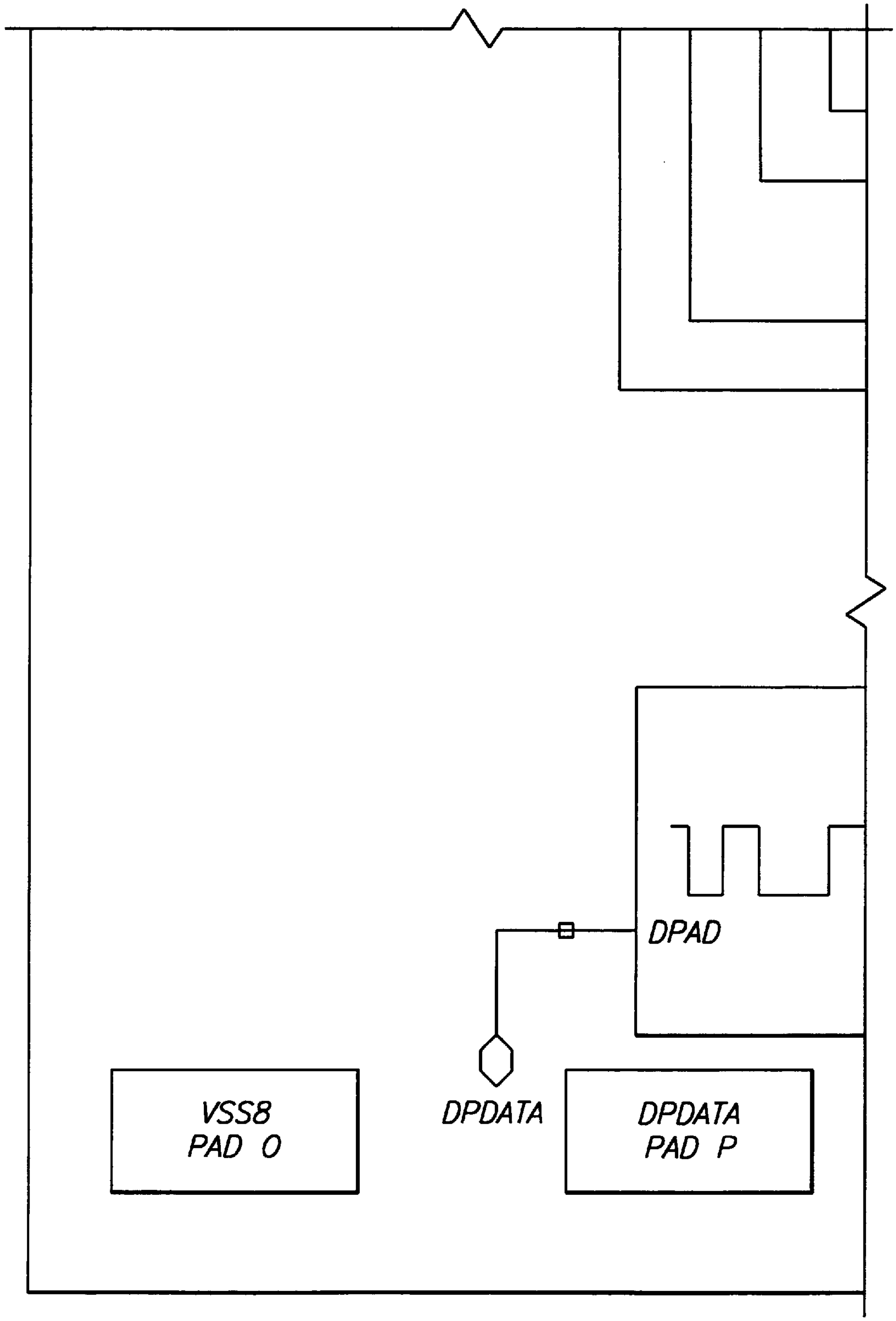
Figure 6E:
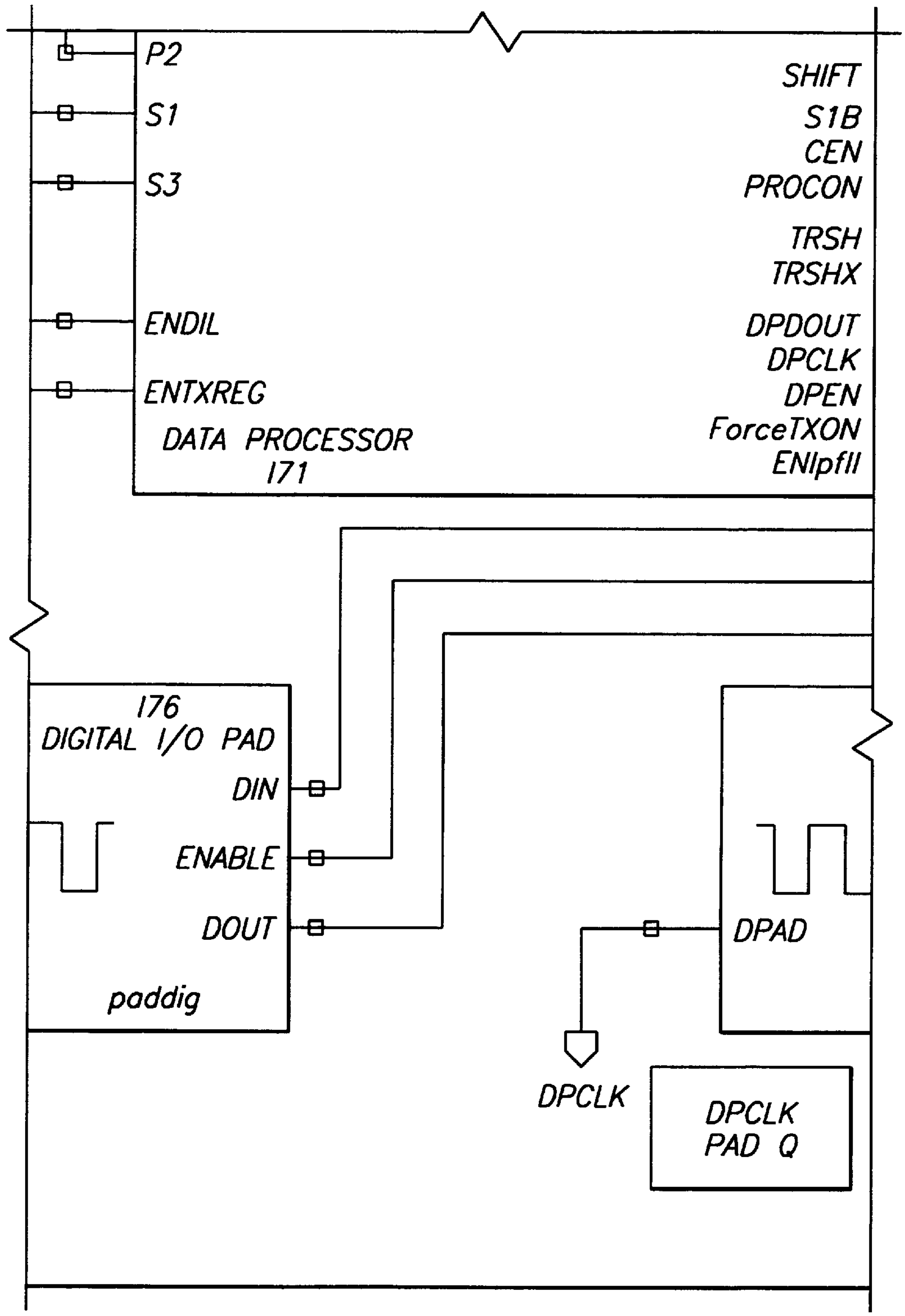
Figure 6E:
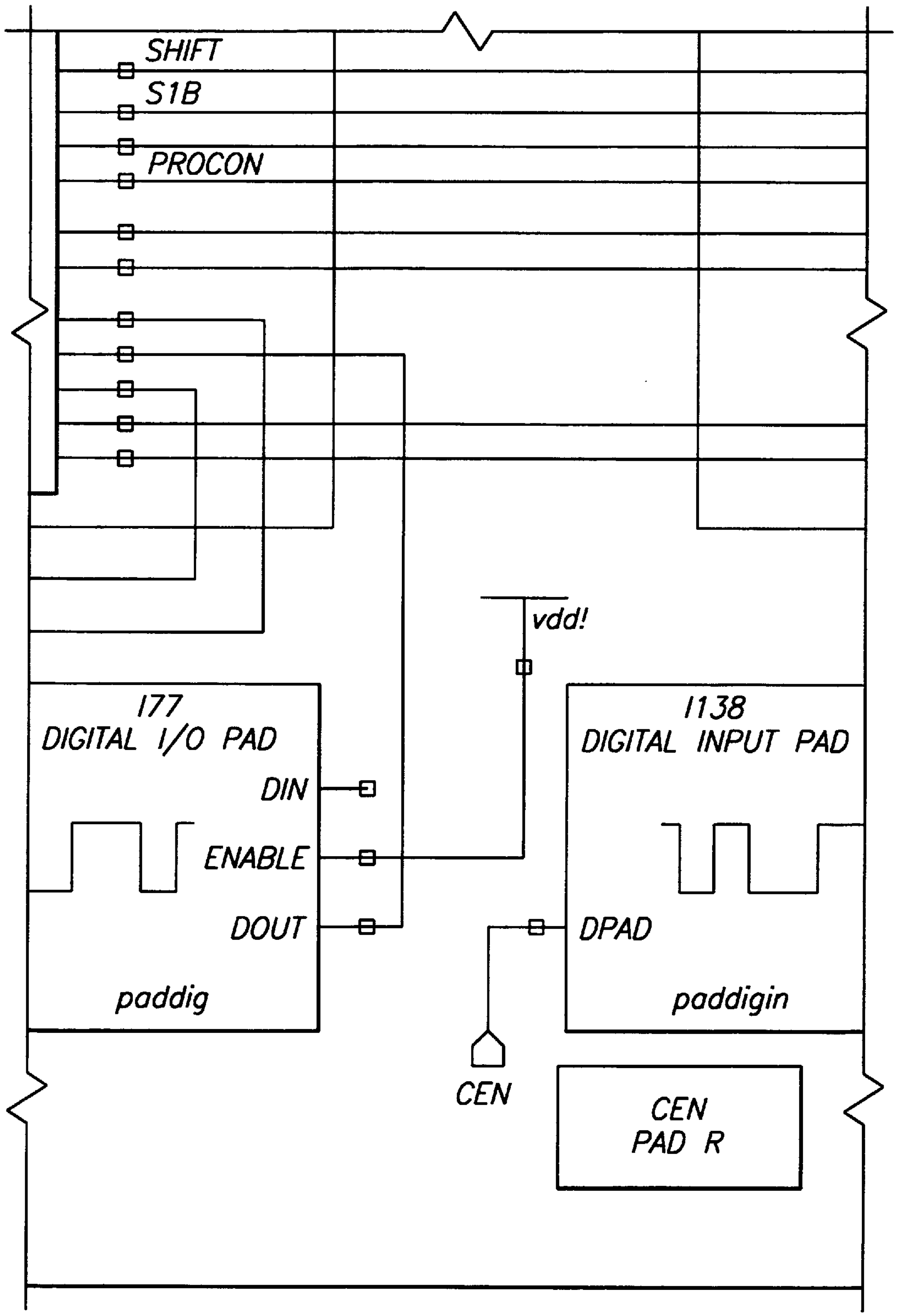
Figure 6E:
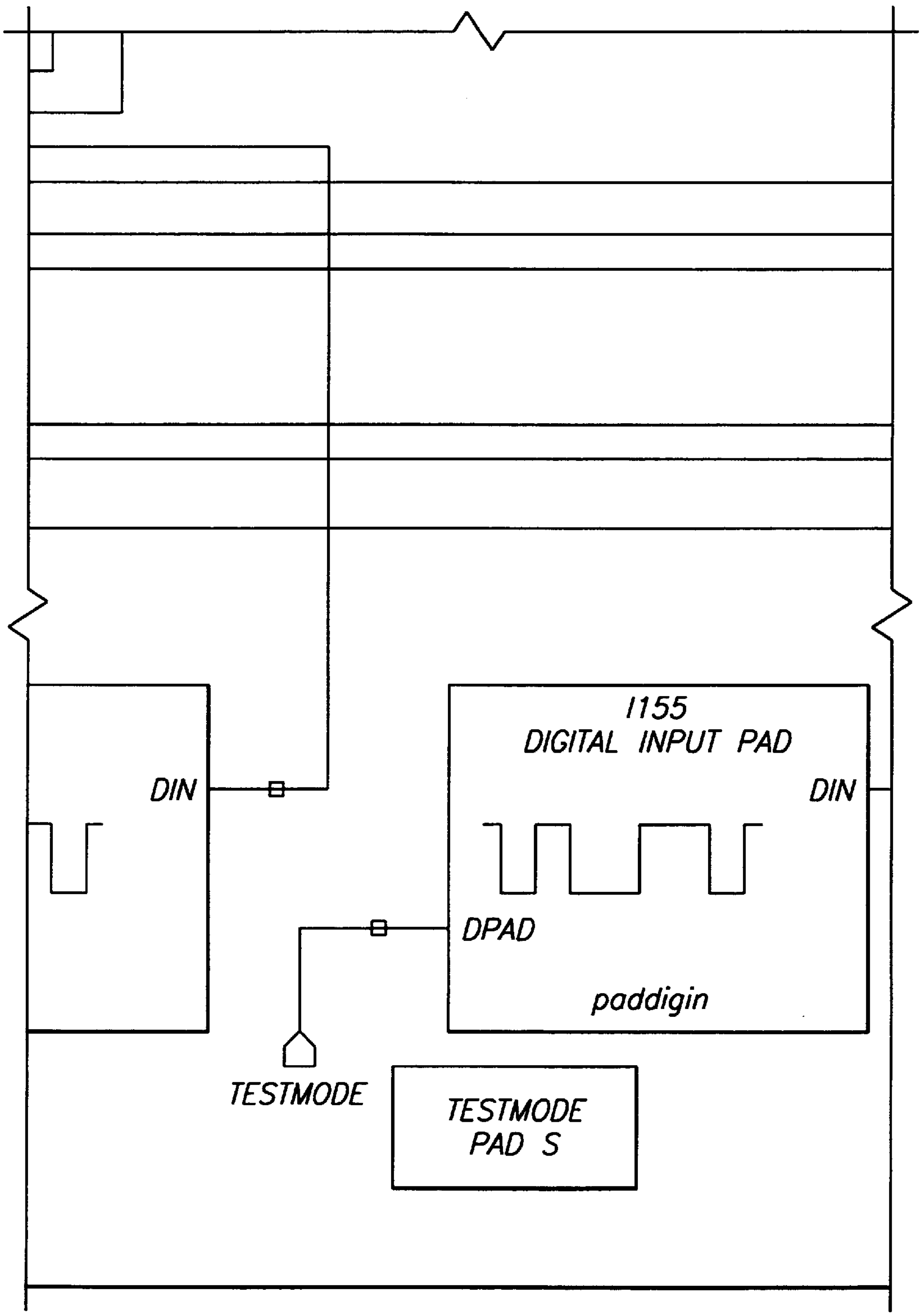
Figure 6E:
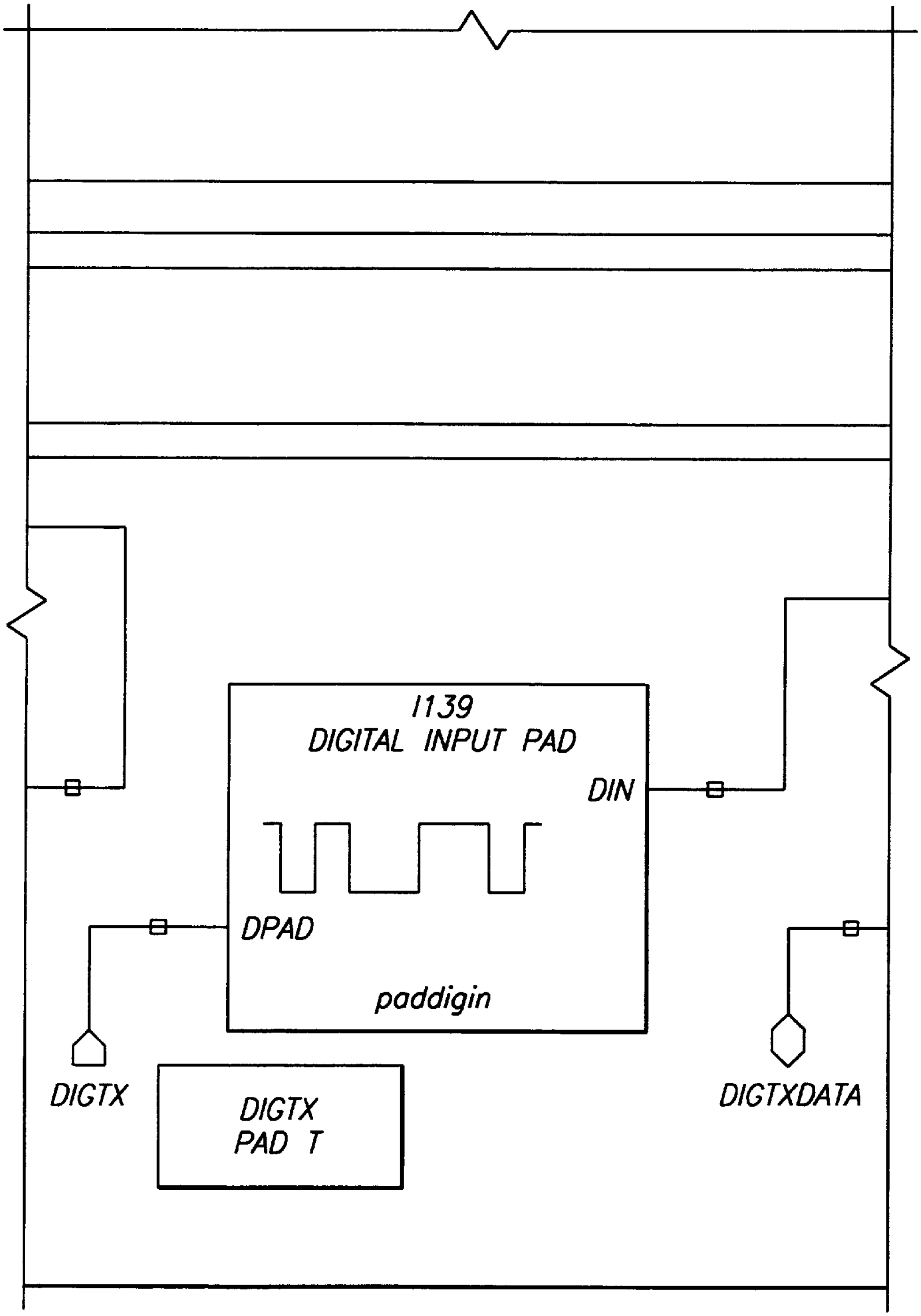
Figure 6E:
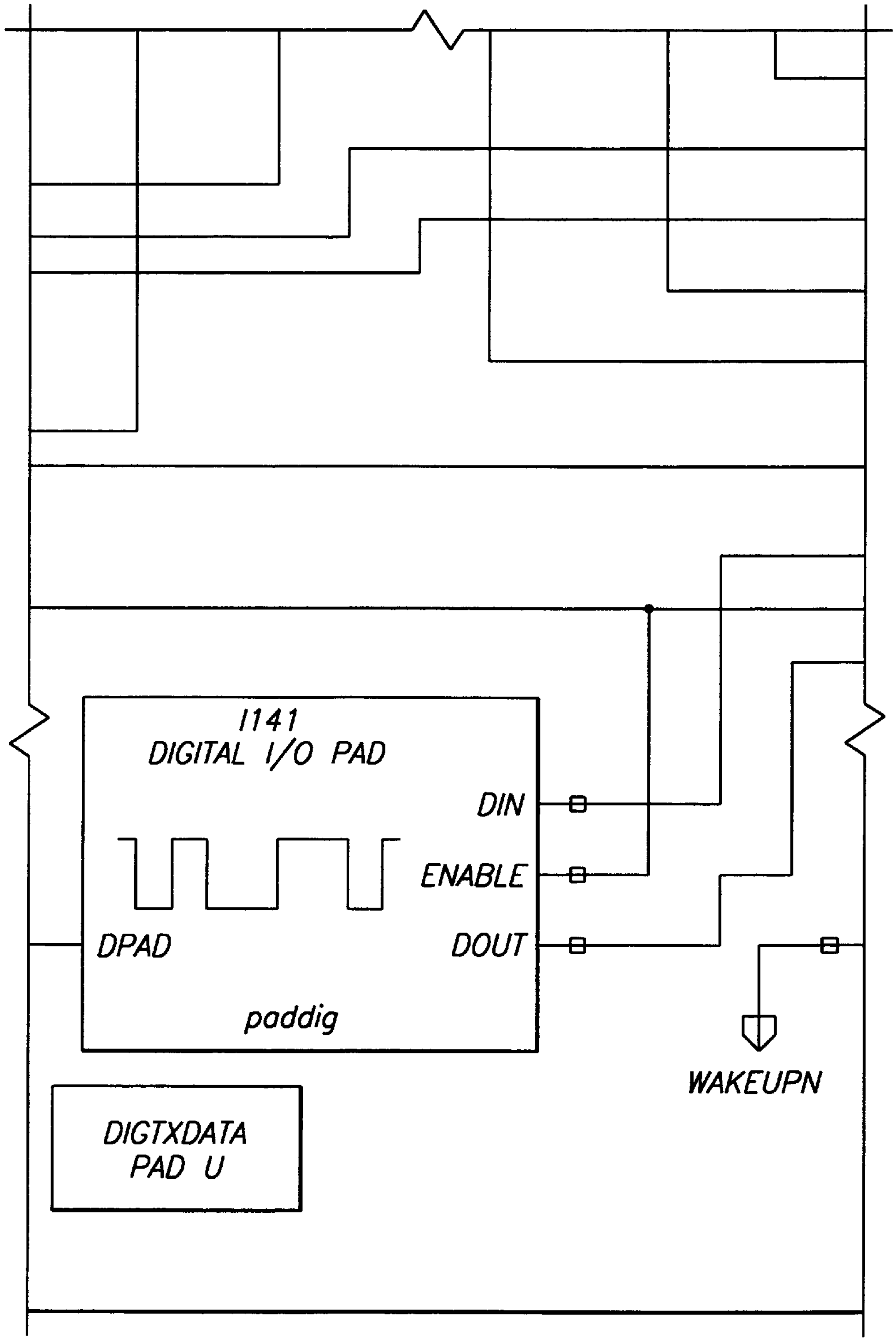
Figure 6E:
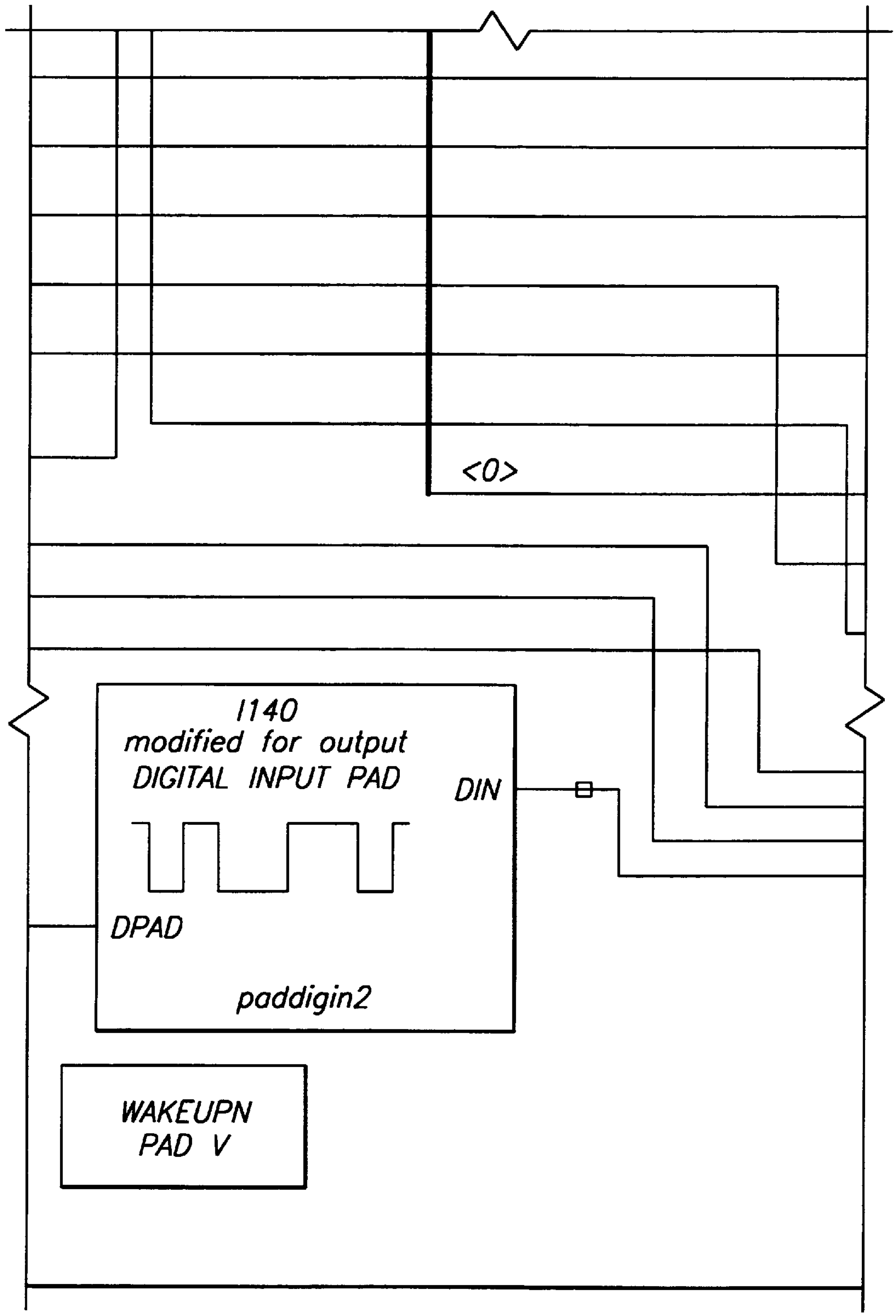
Figure 6E:
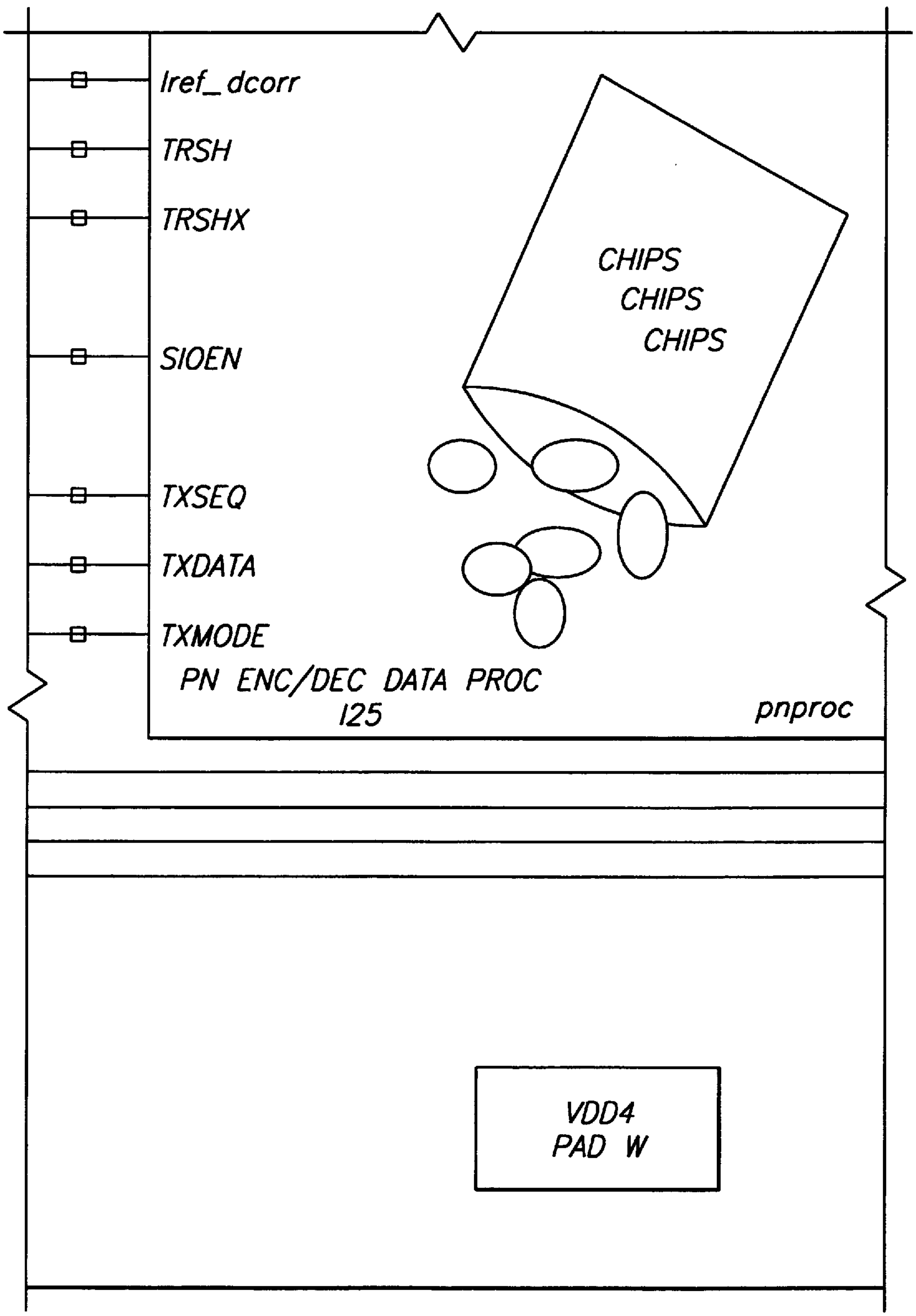
Figure 6E:
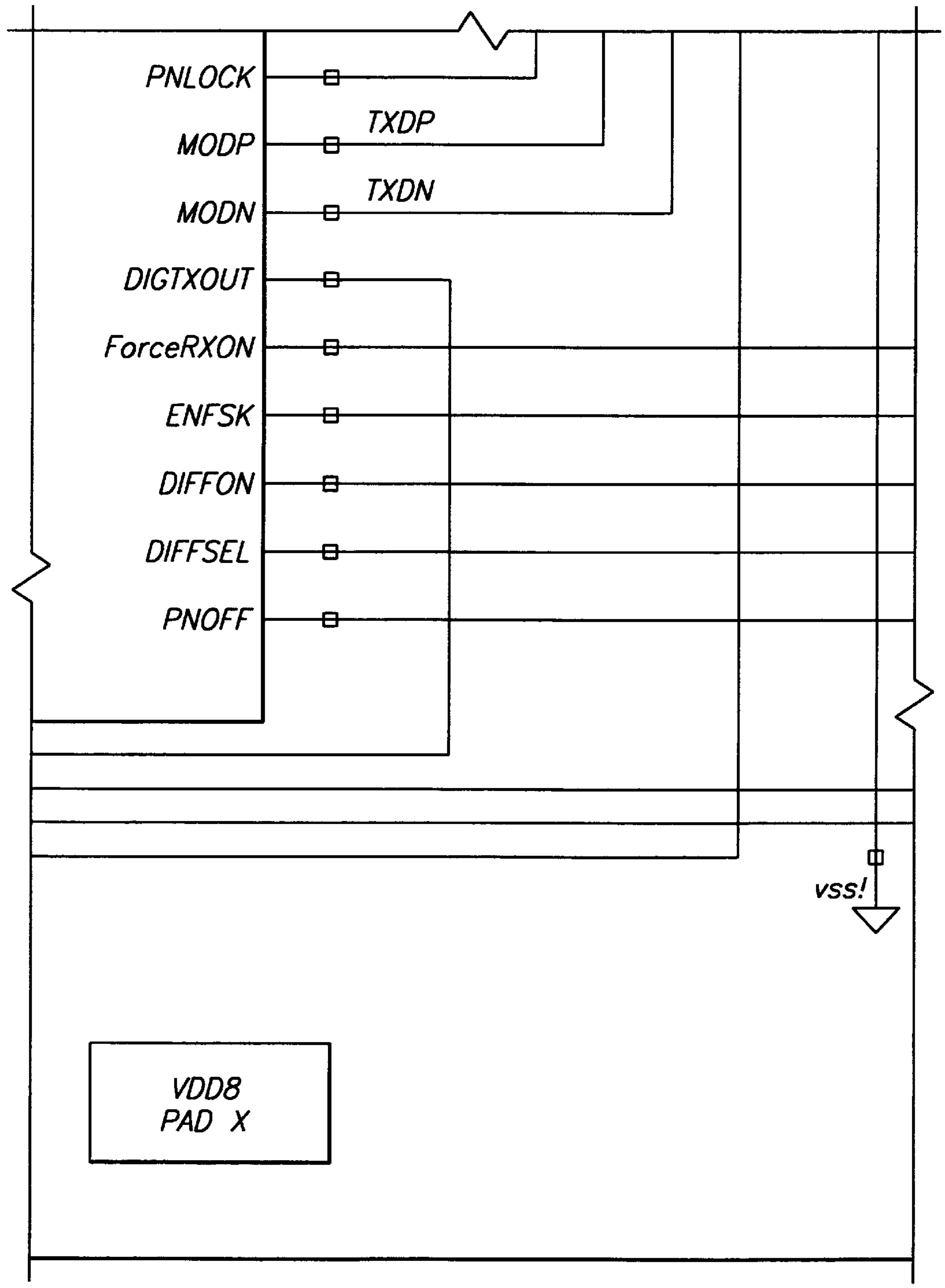
Figure 6E:
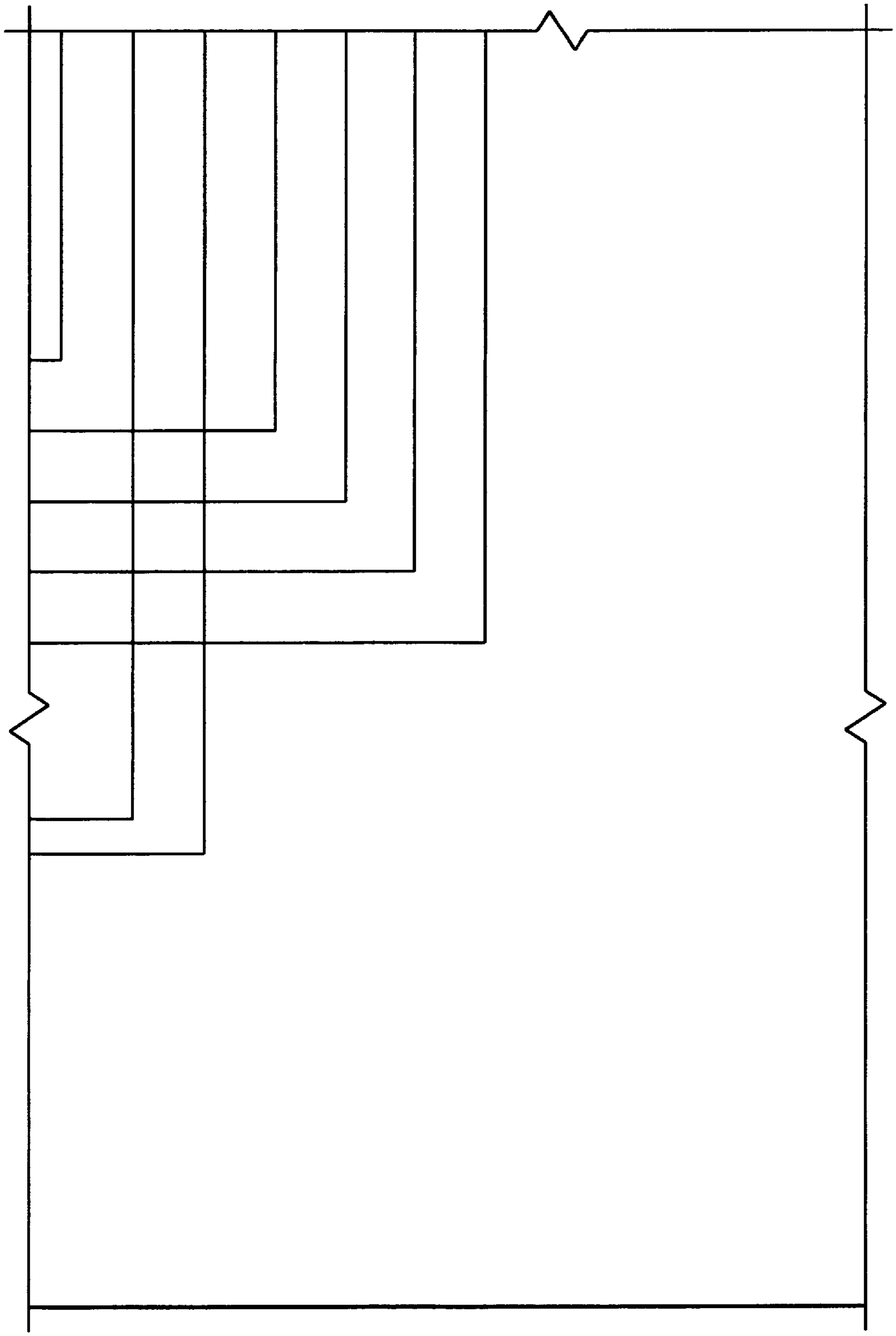
Figure 6E:
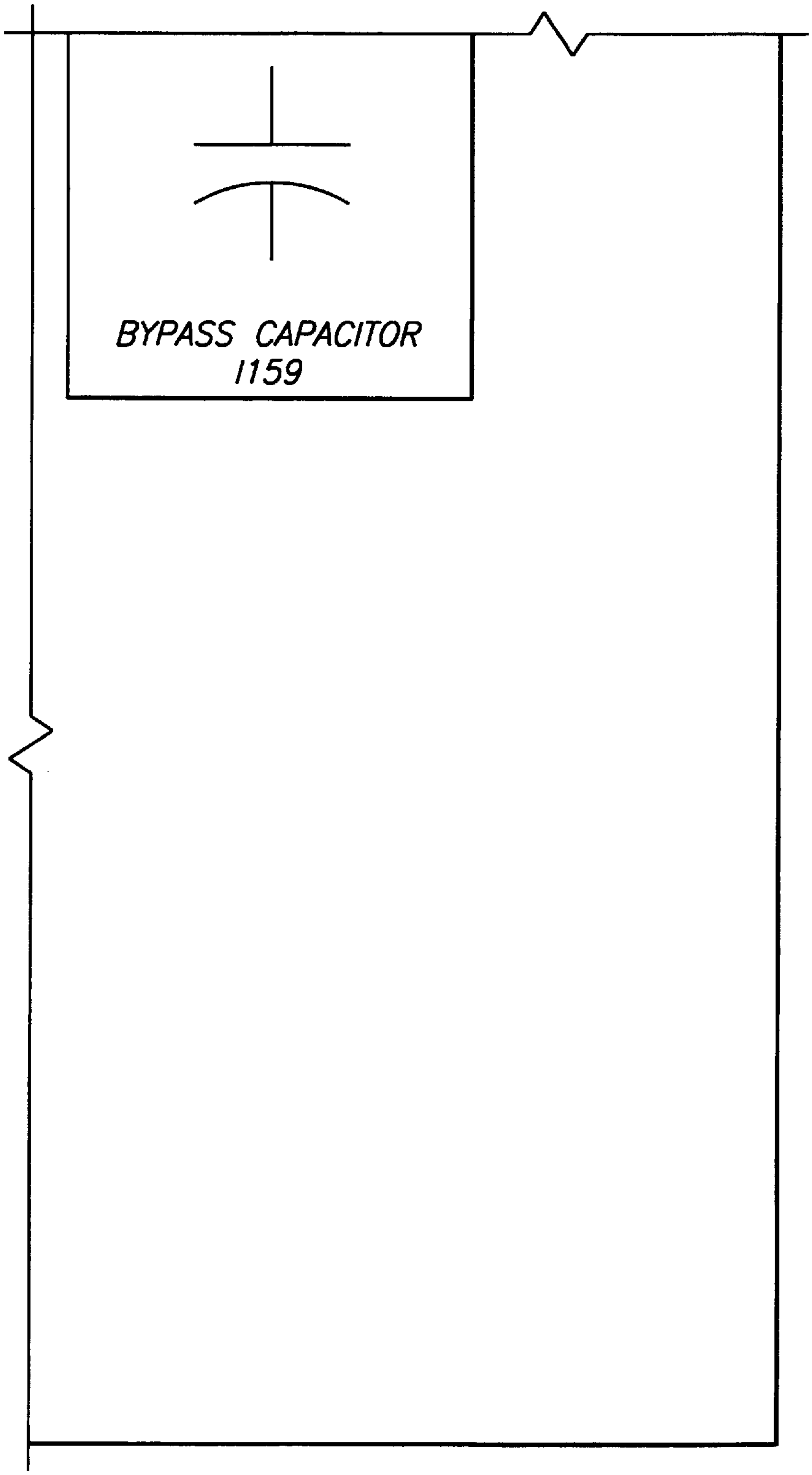
Figure 7A:
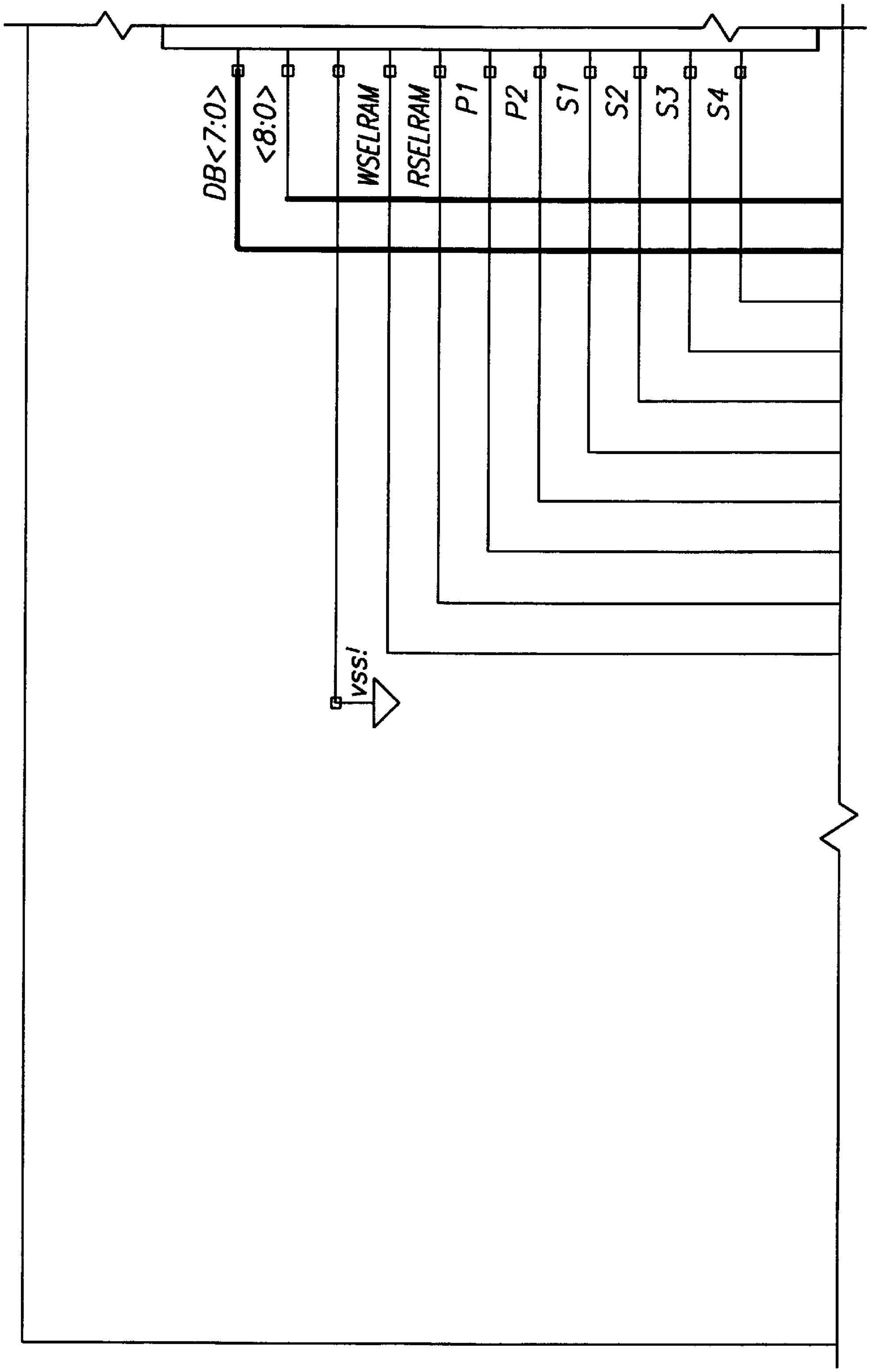
FIG. 7 is a graph illustrating how FIGS. 7AA–HJ are to be assembled. After such assembly, FIGS. 7AA–HJ provide a circuit drawing of a data processor "dataproc" included in the circuit of FIGS. 6AA–EK.
Figure 7A:
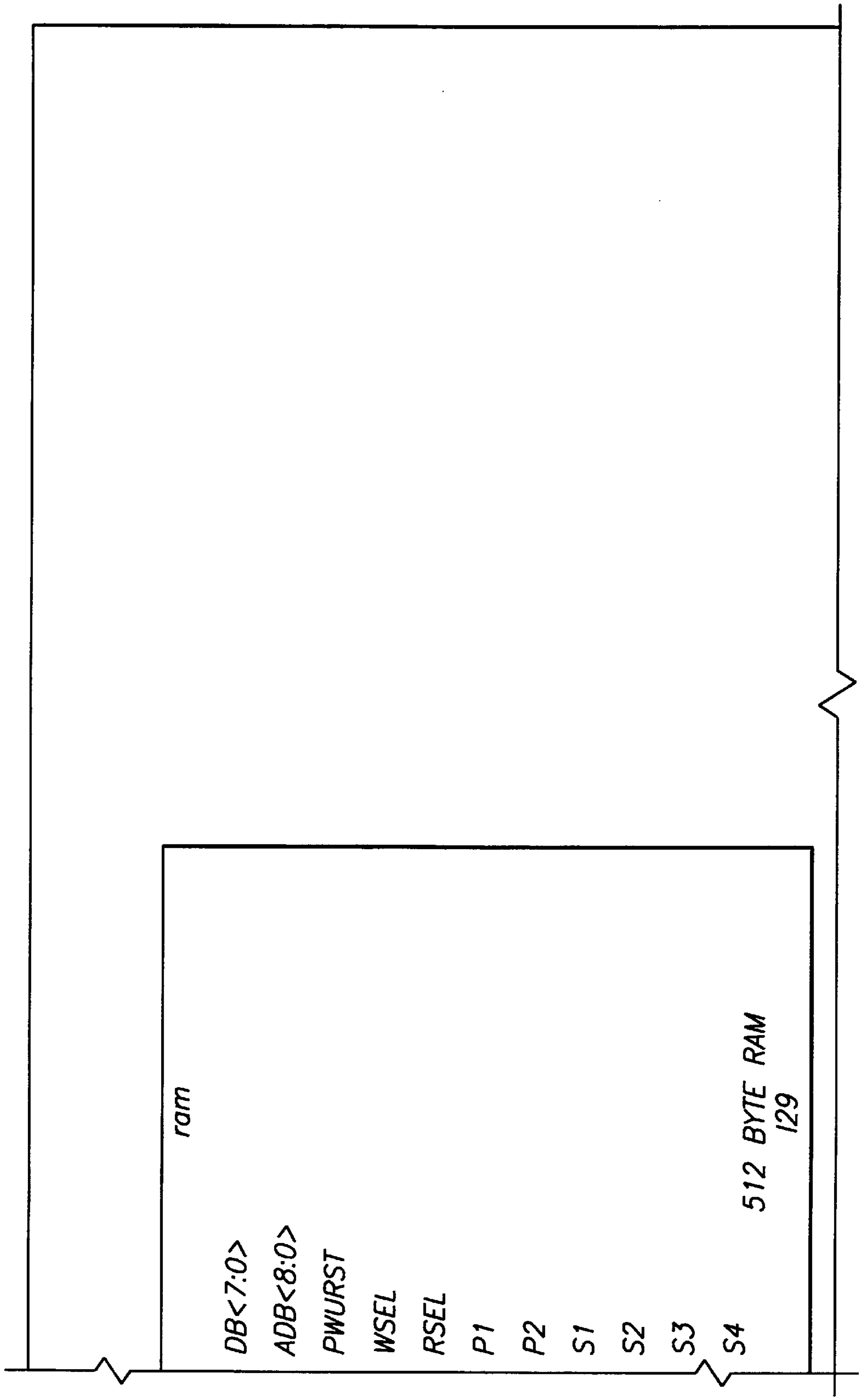
Figure 7B:
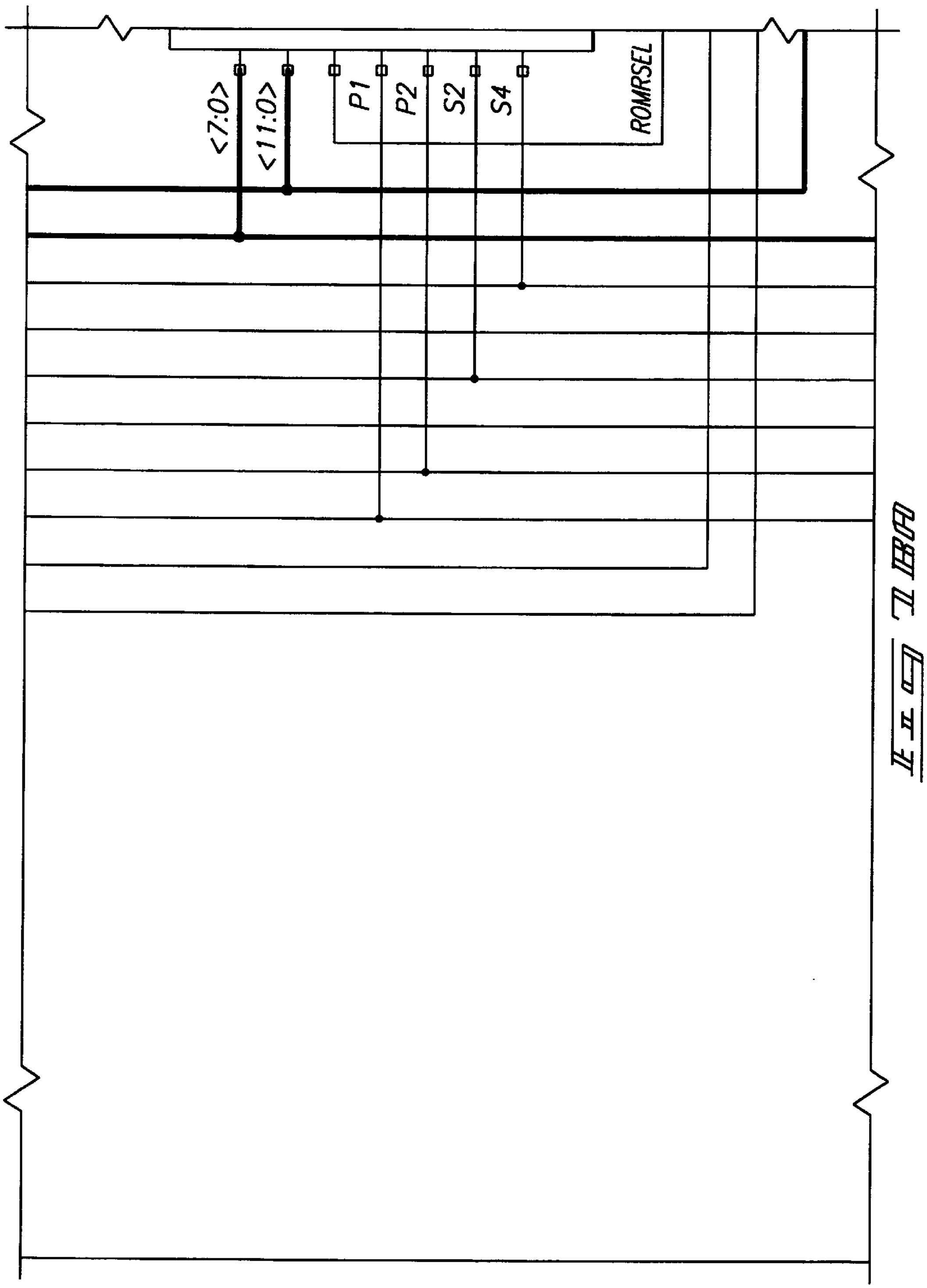
Figure 7B:
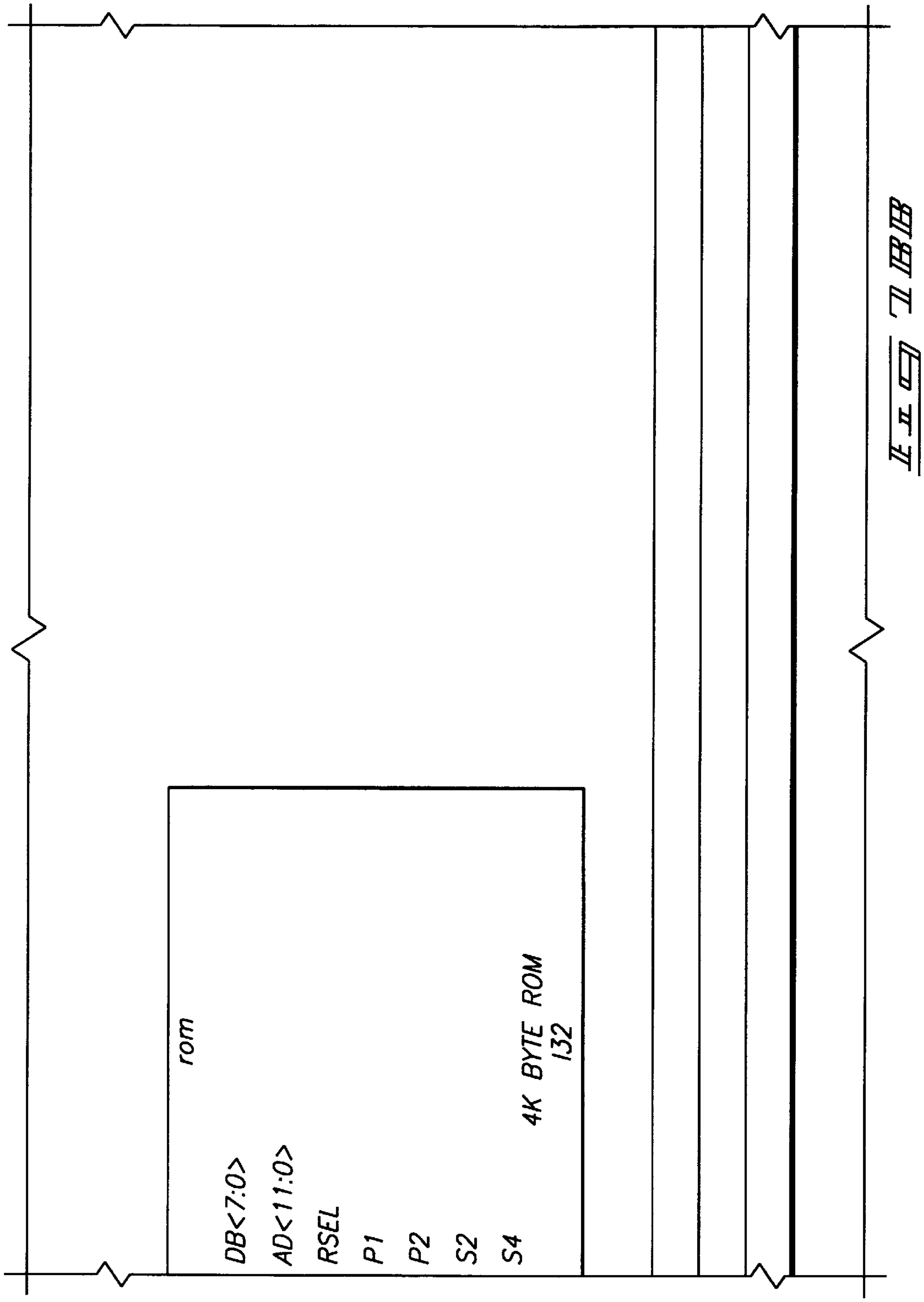
Figure 7B:
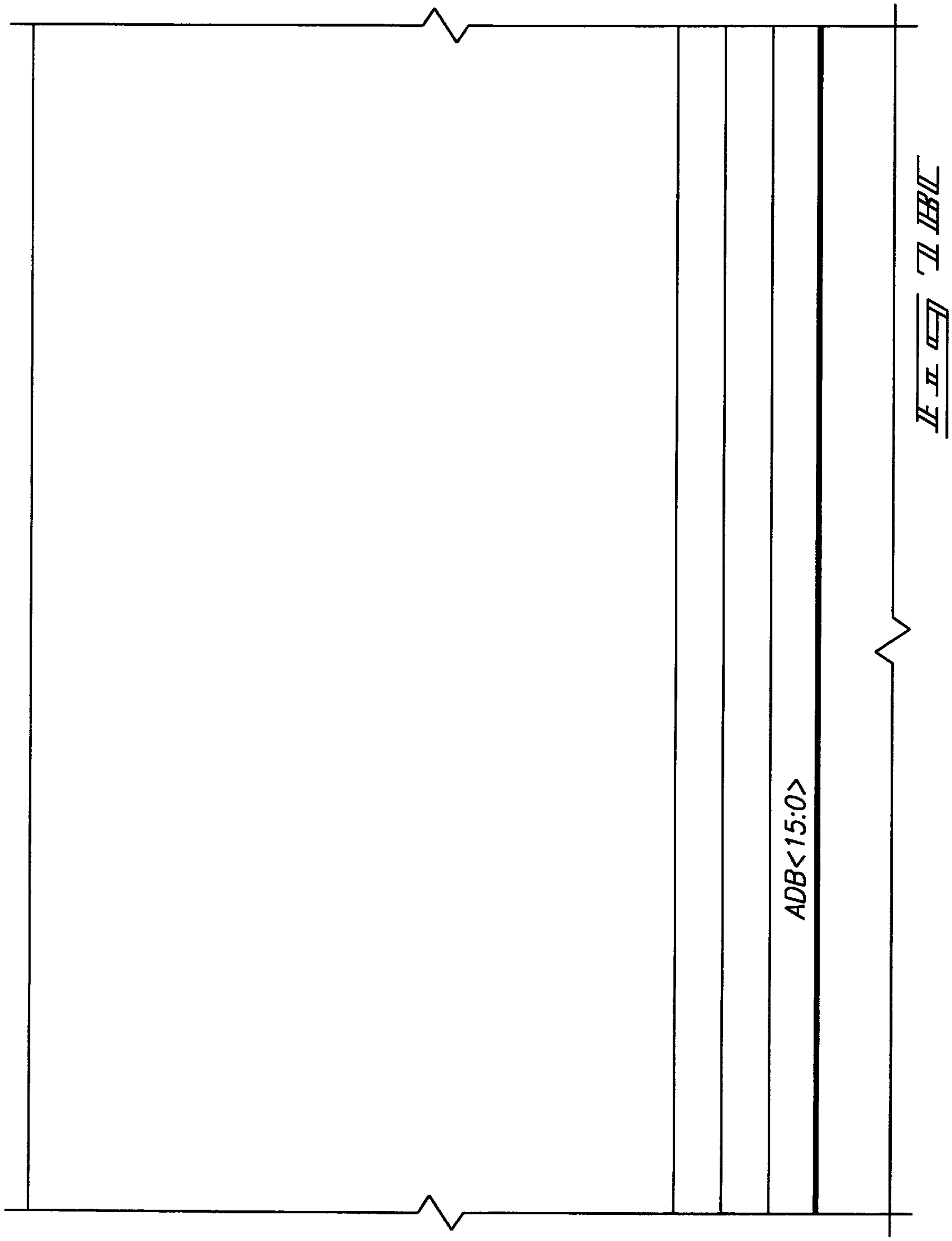
Figure 7B:
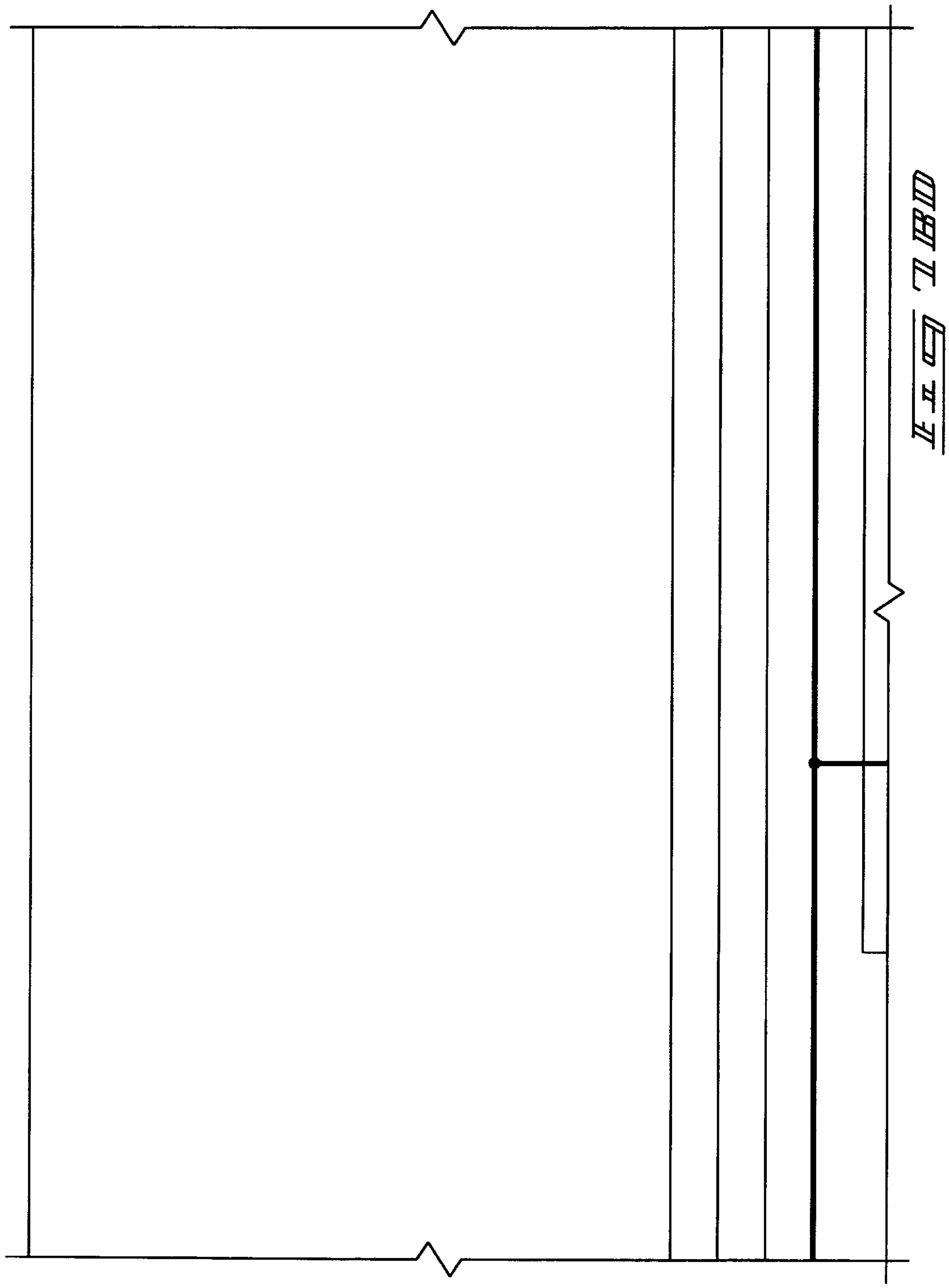
Figure 7B:
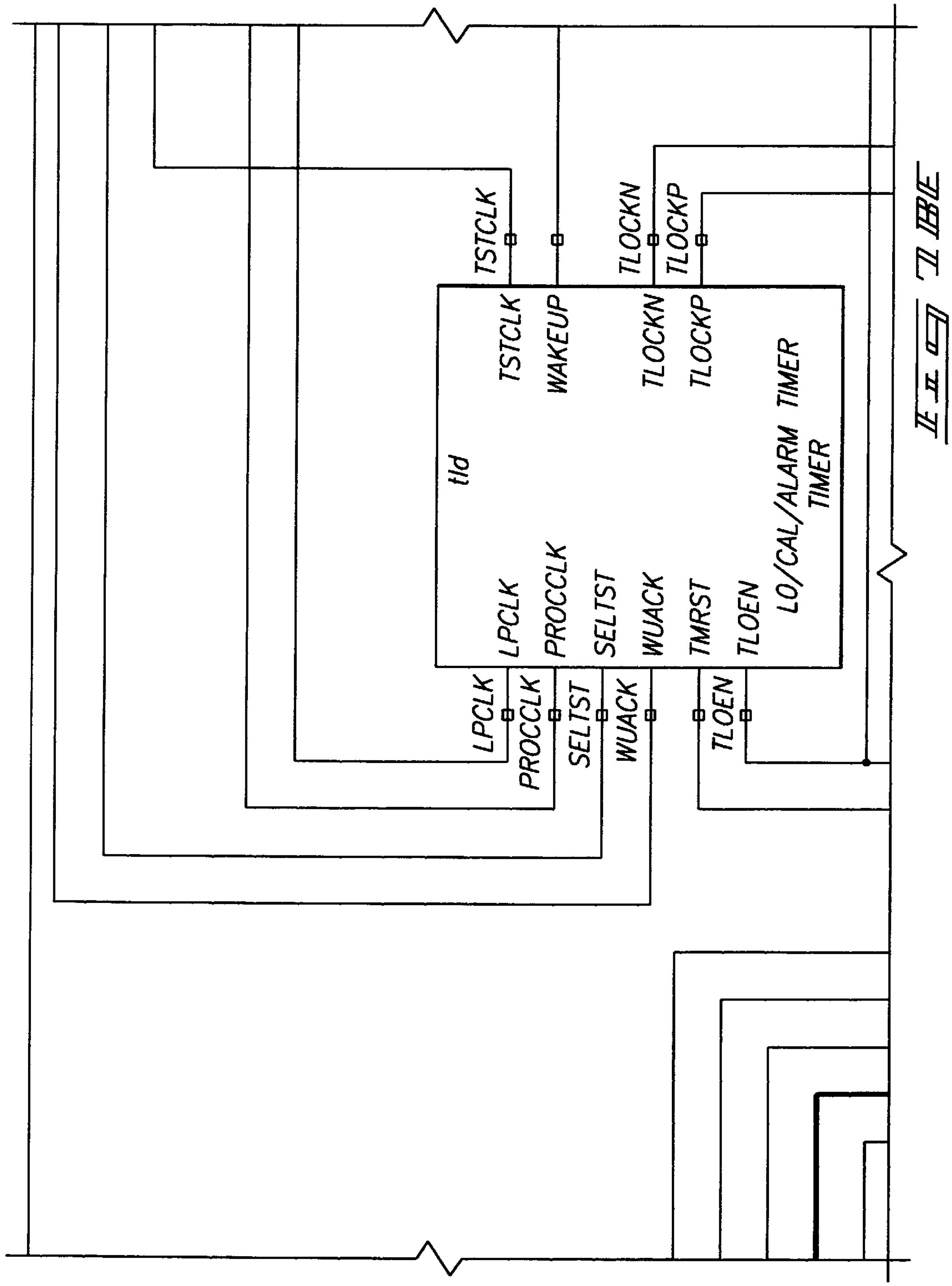
Figure 7B:
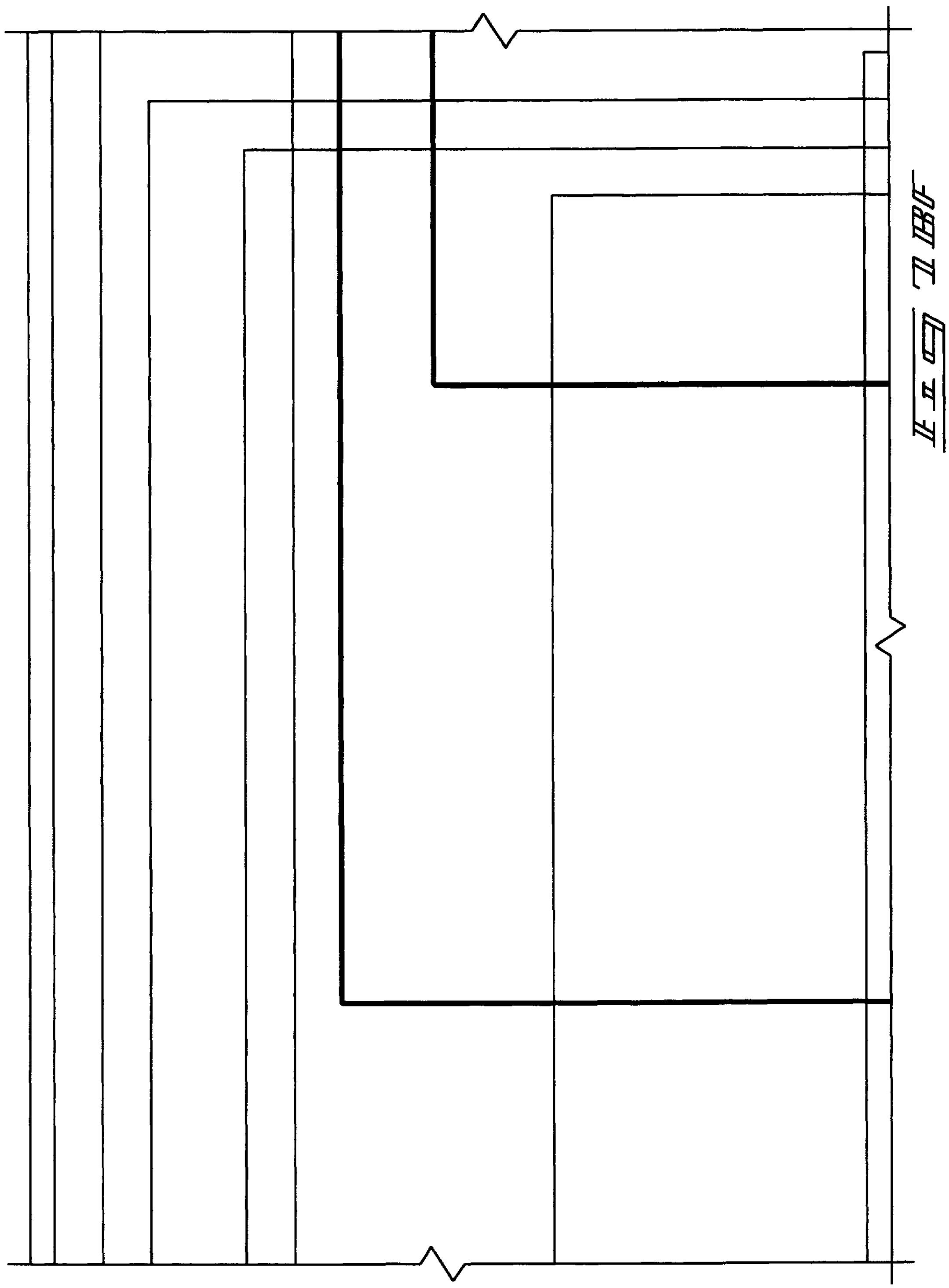
Figure 7B:
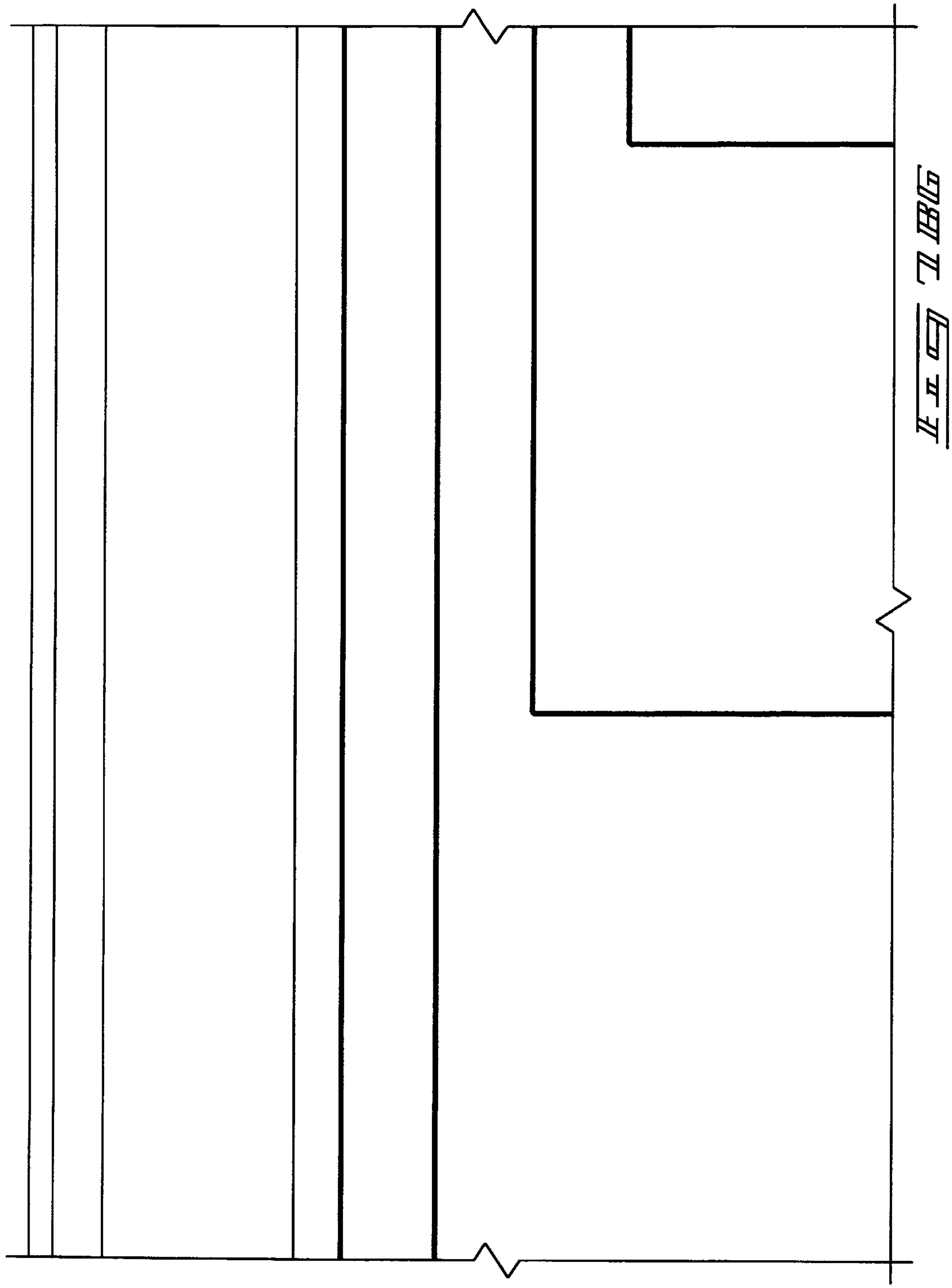
Figure 7A:
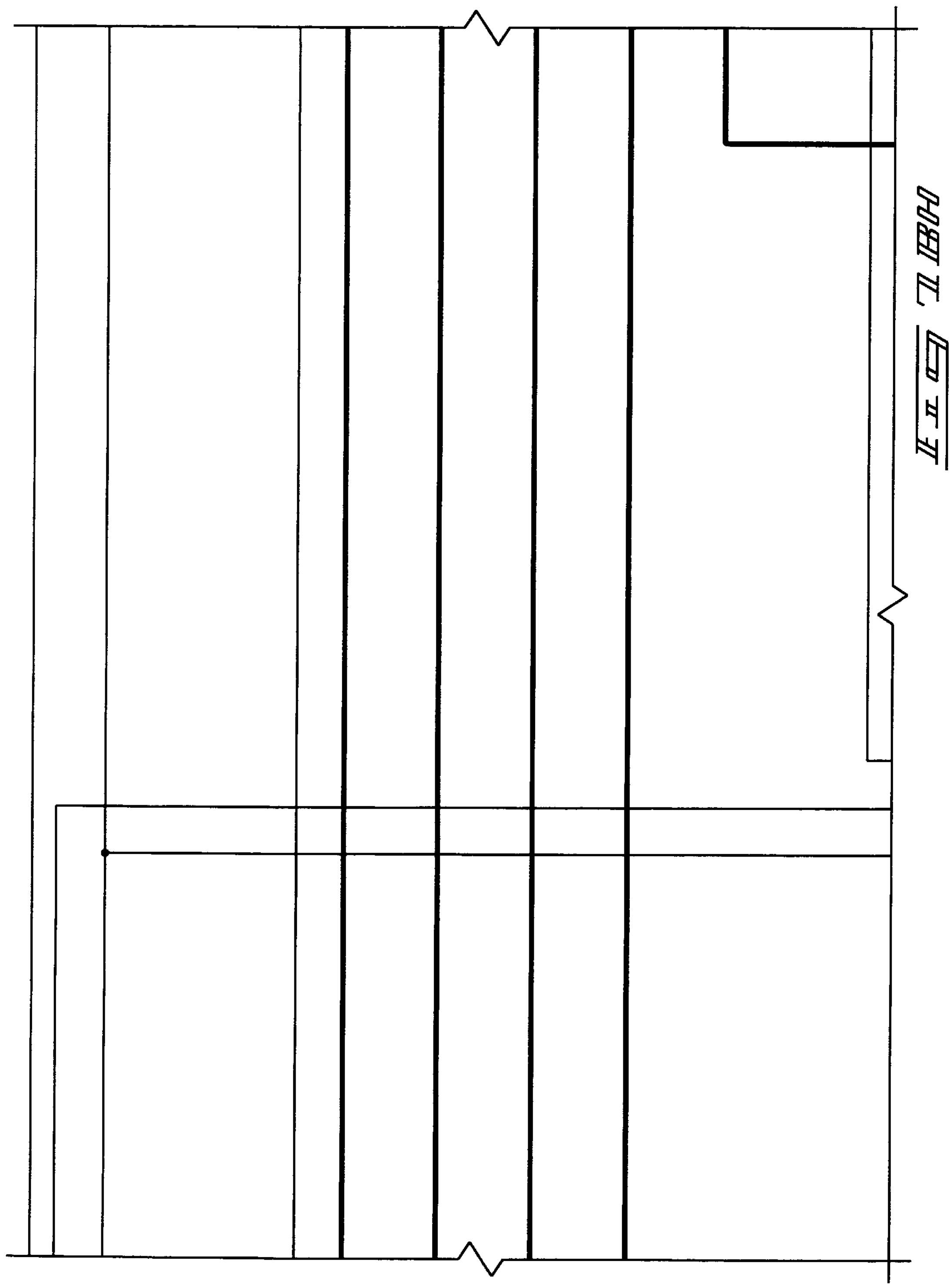
Figure 7B:
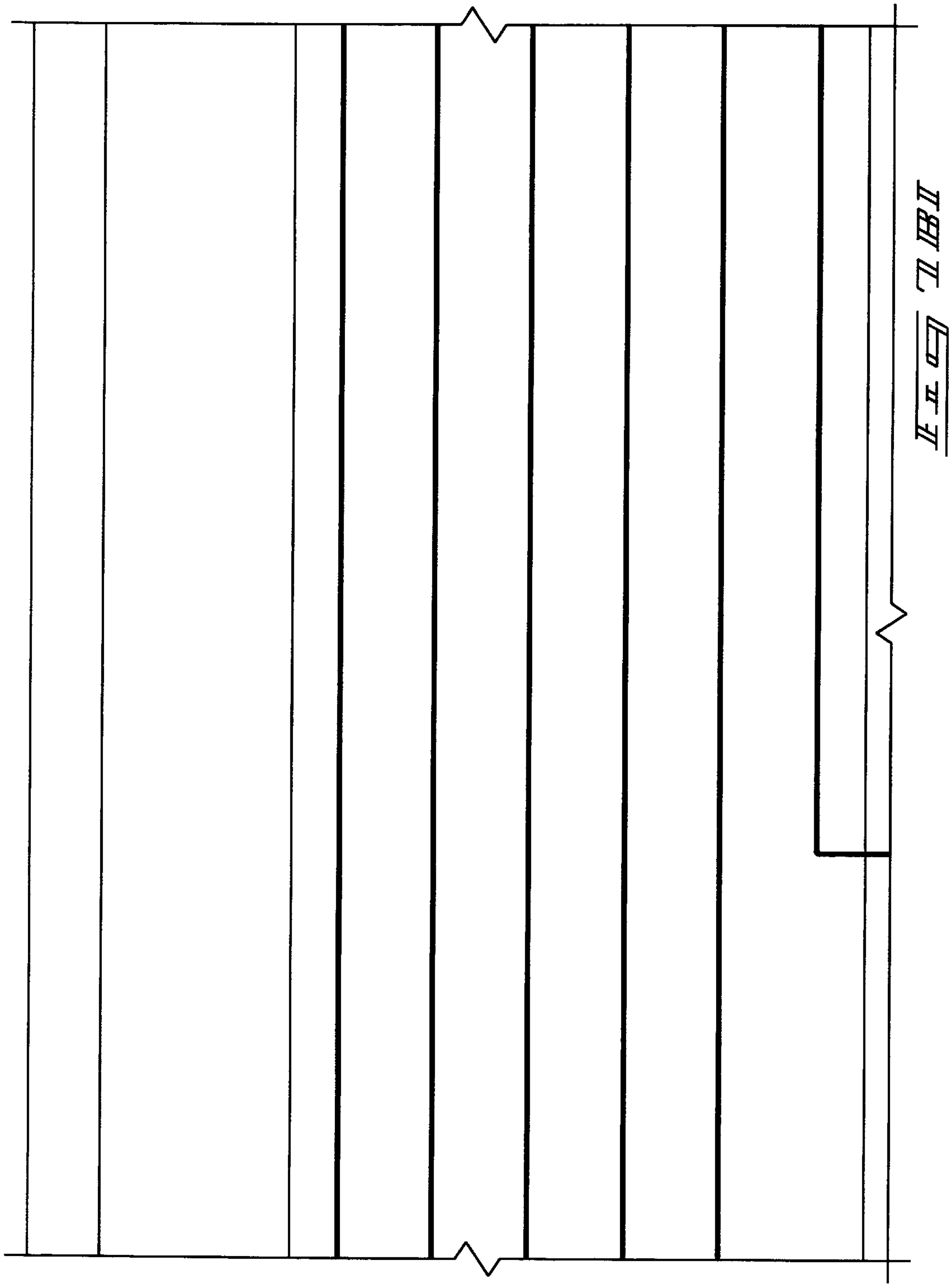
Figure 7B:
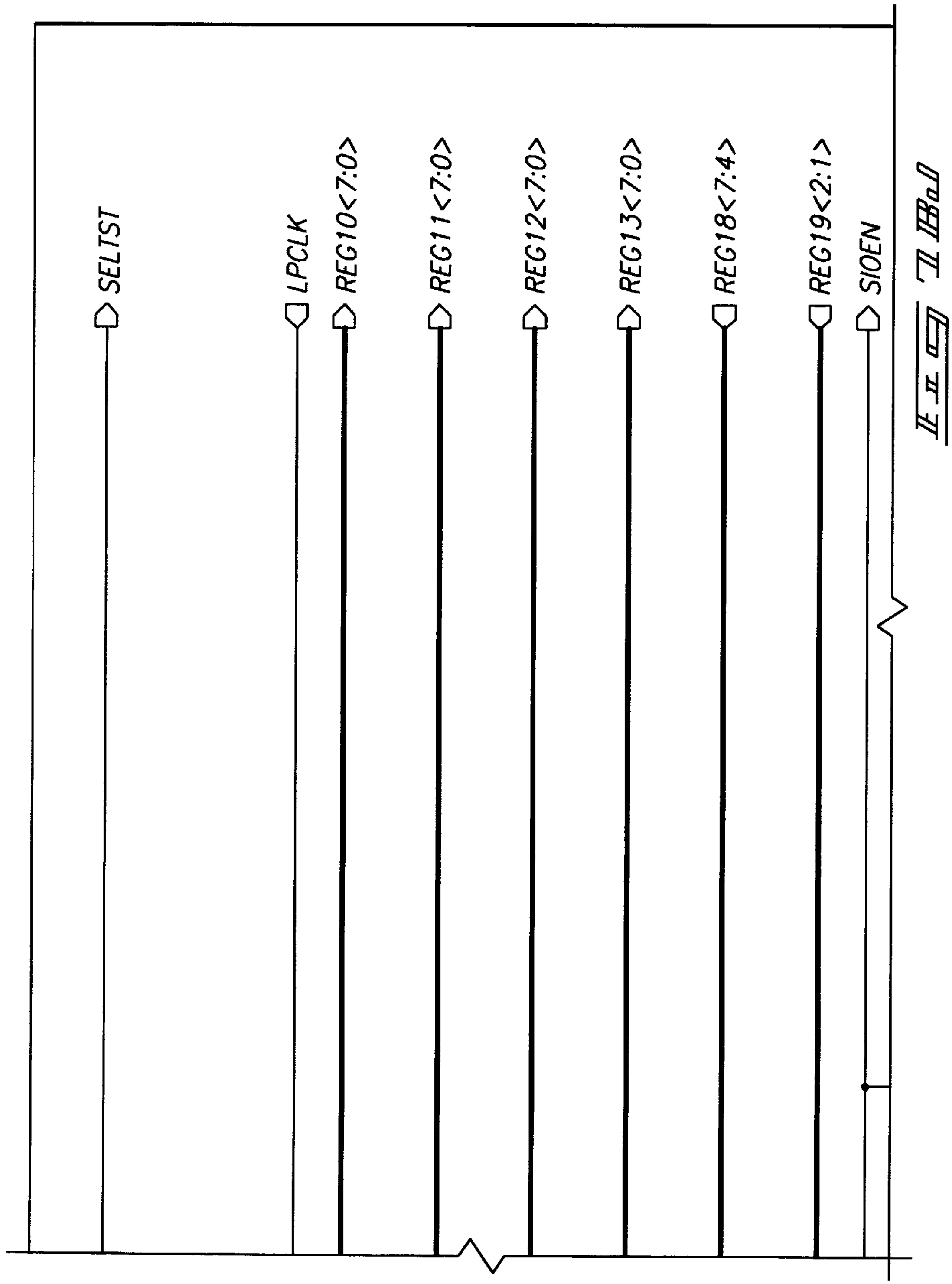
Figure 71A:
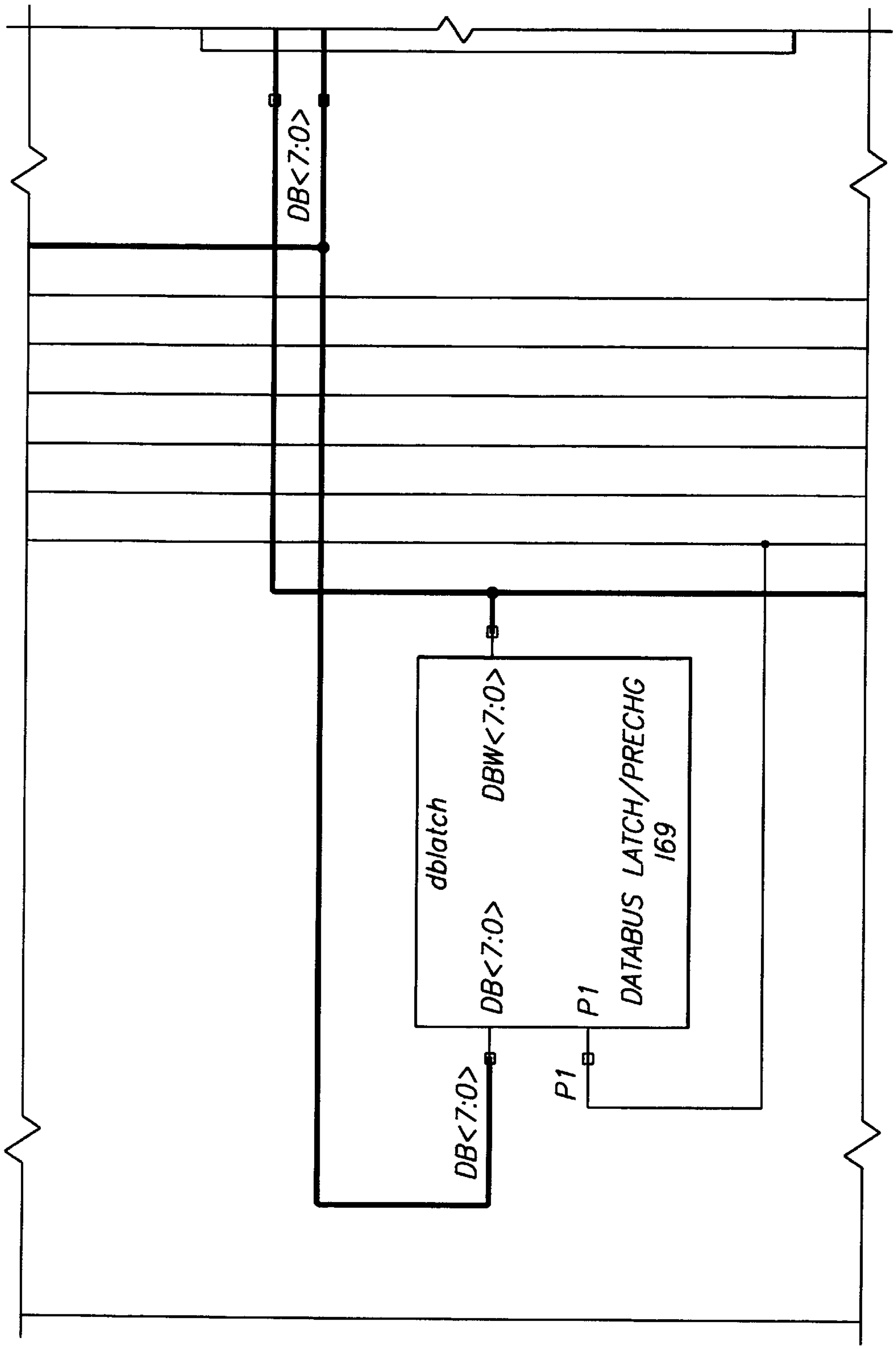
Figure 7C:
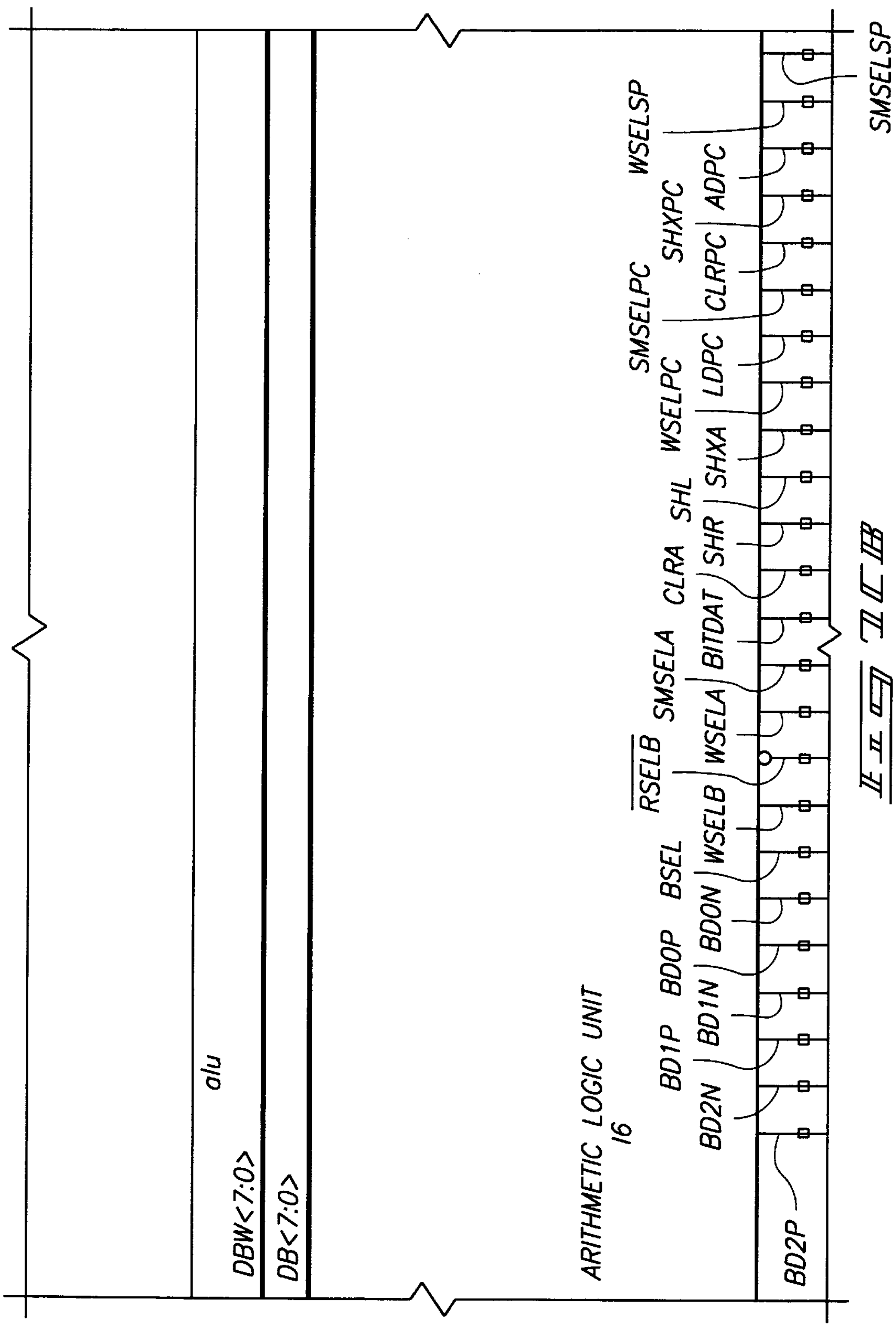
Figure 7C:
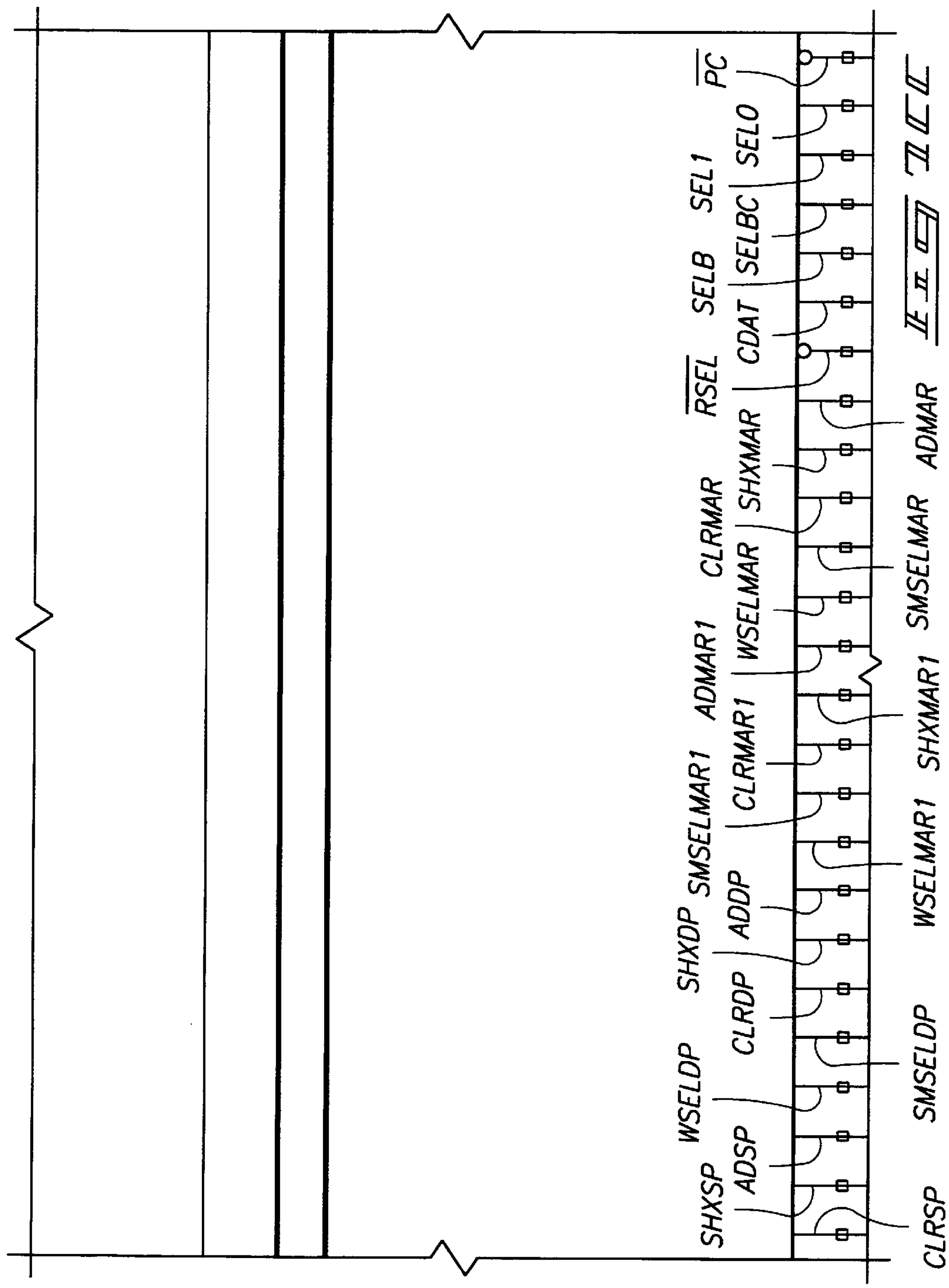
Figure 7C:
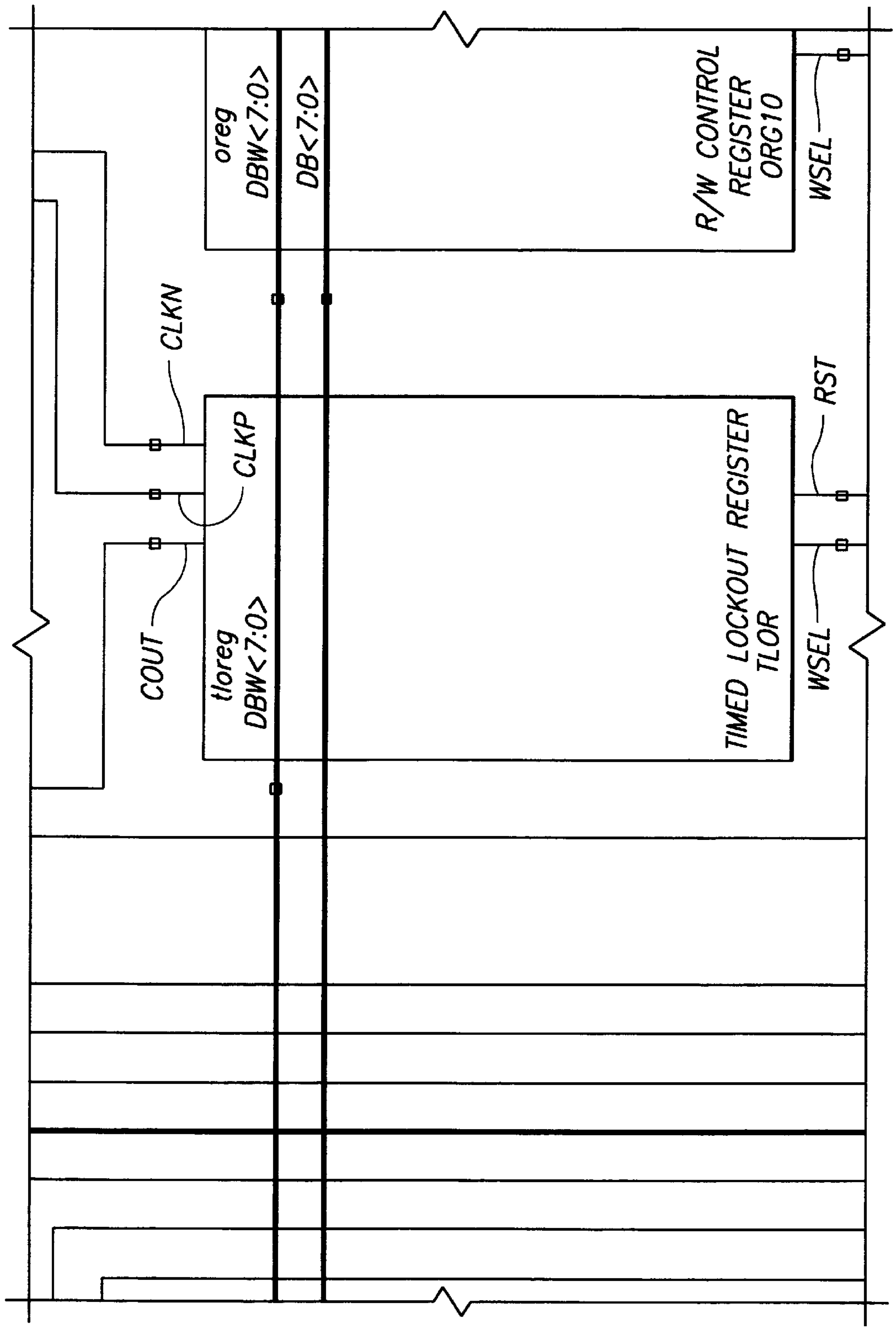
Figure 11C:
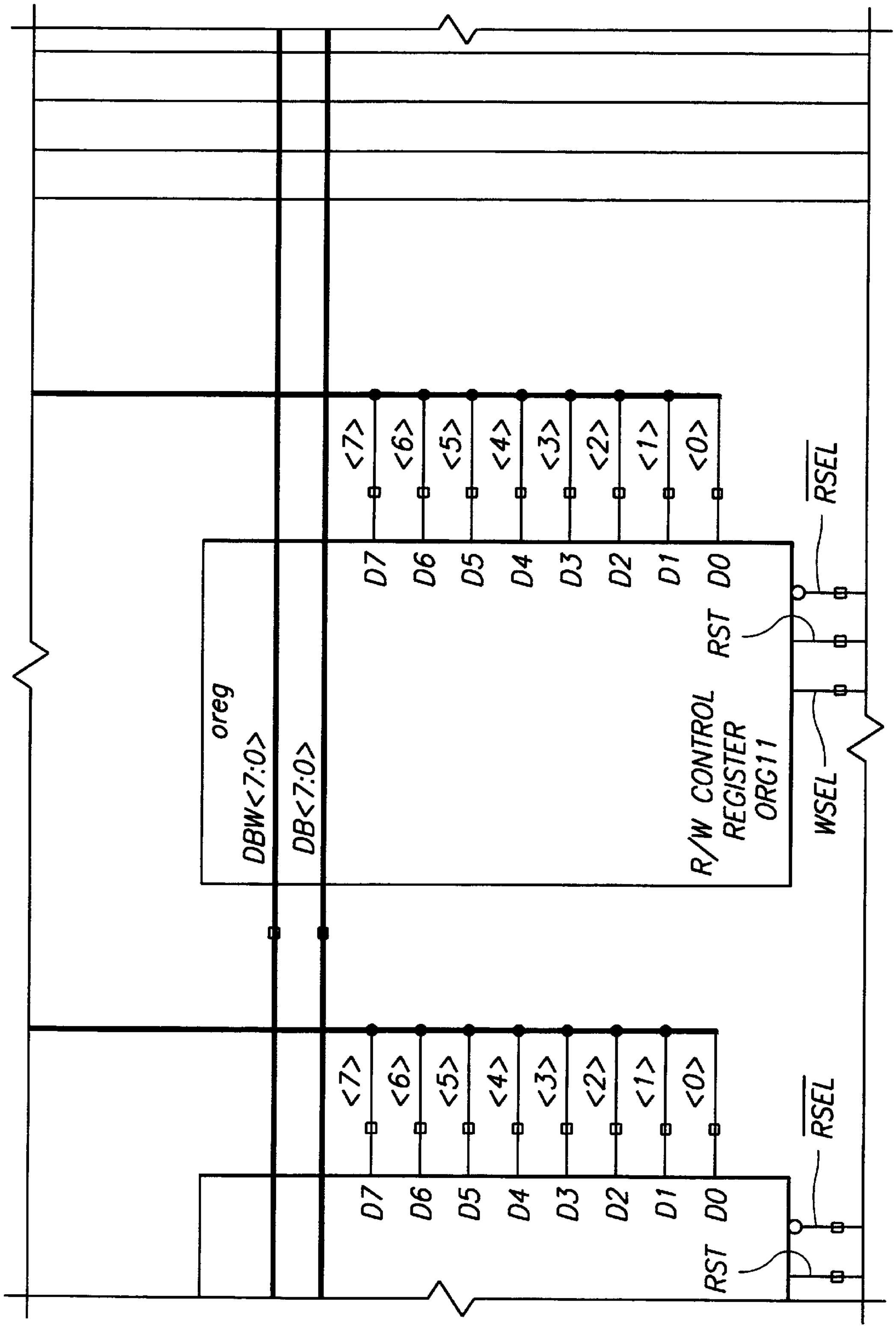
Figure 7L:
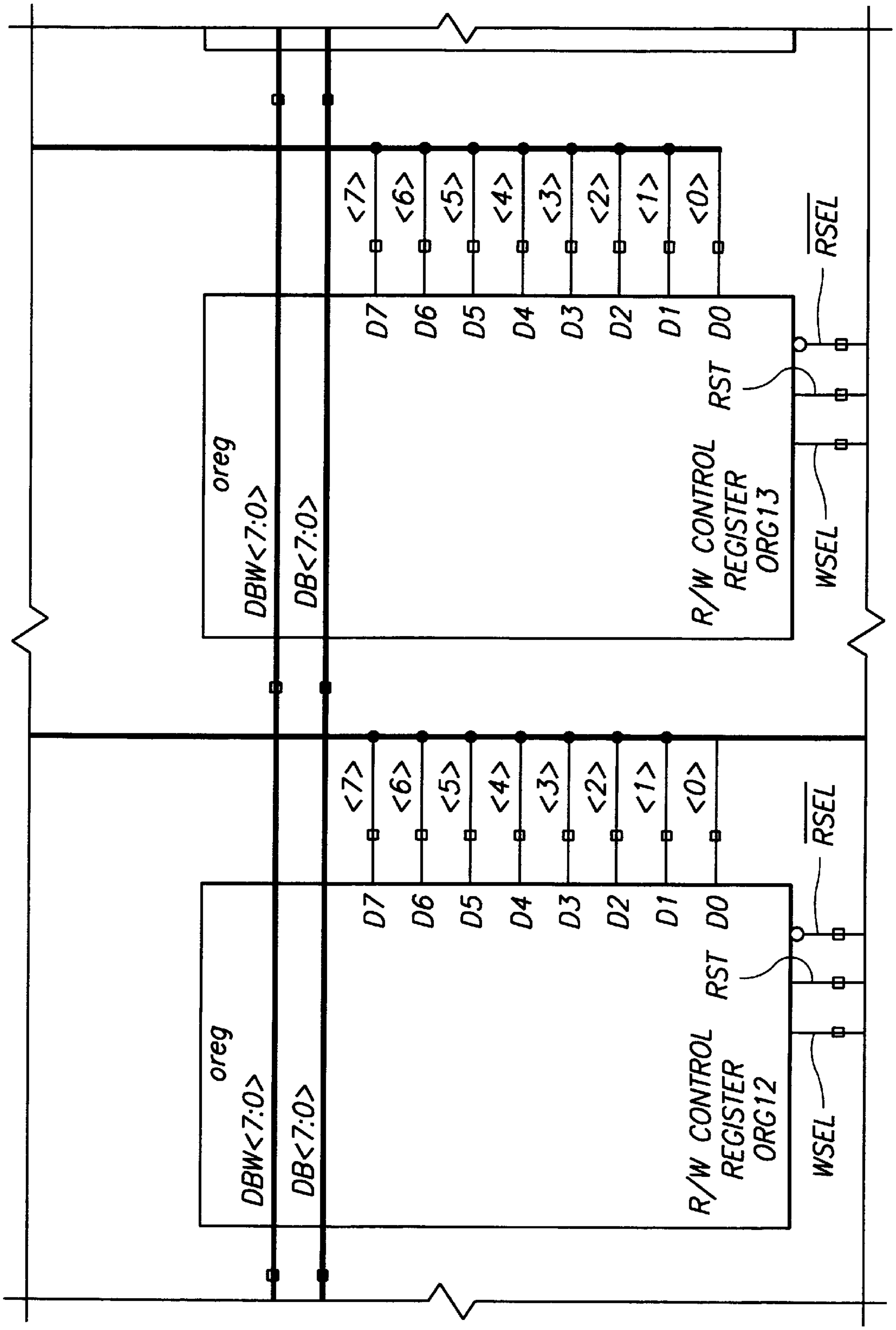

FIG. 13 is a circuit drawing of a digital input pad buffer "paddigin" included in the circuit of FIGS. 6AA–EK.

FIG. 13.5 is a circuit drawing of a digital input pad buffer "paddigin2" included in the circuit of FIGS. 6AA–EK.

FIG. 14 is a circuit drawing of an analog I/O pad buffer "padalg" included in the circuit of FIGS. 6AA–EK.

Figure 15:
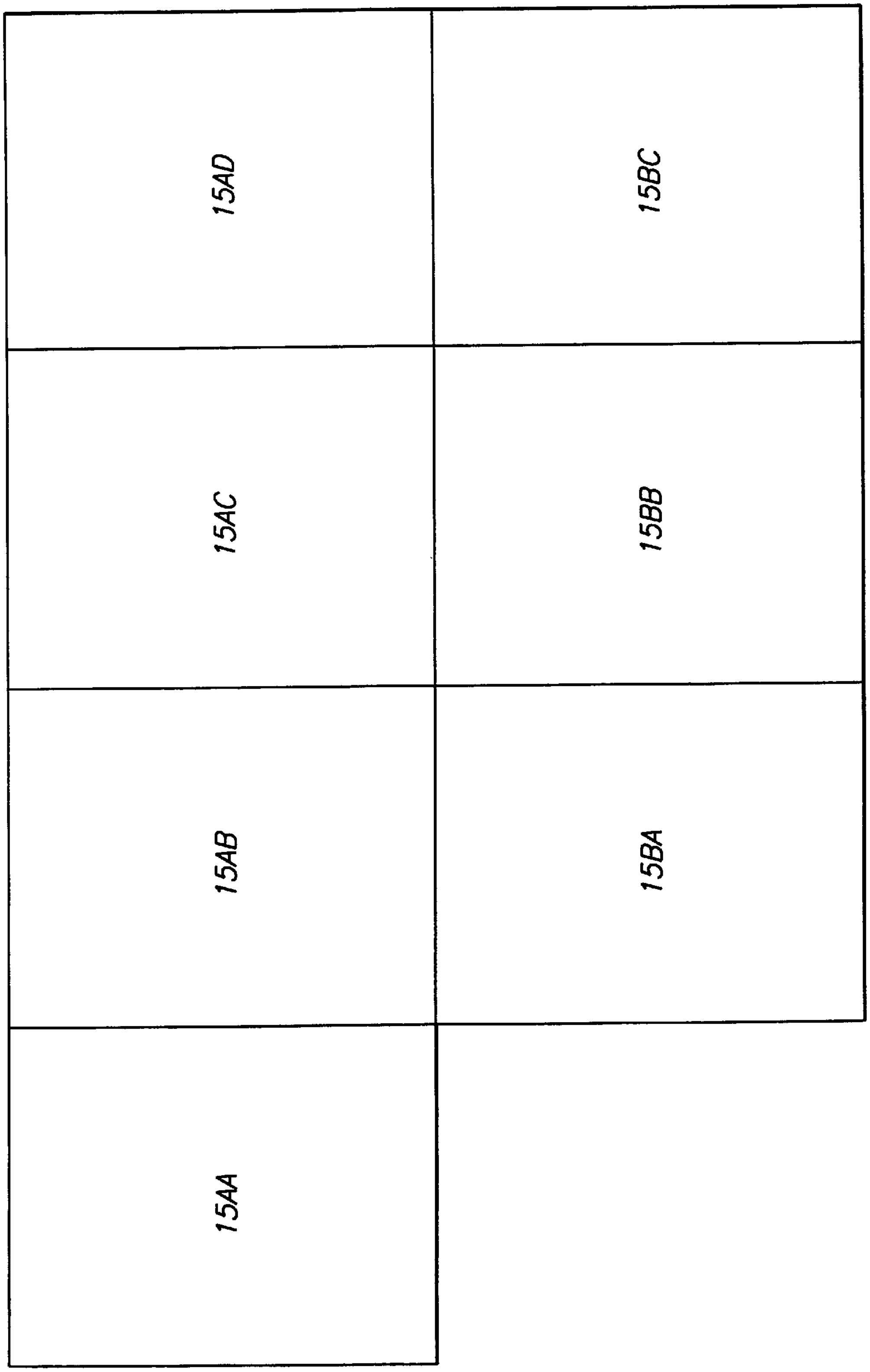
Figure 15A:
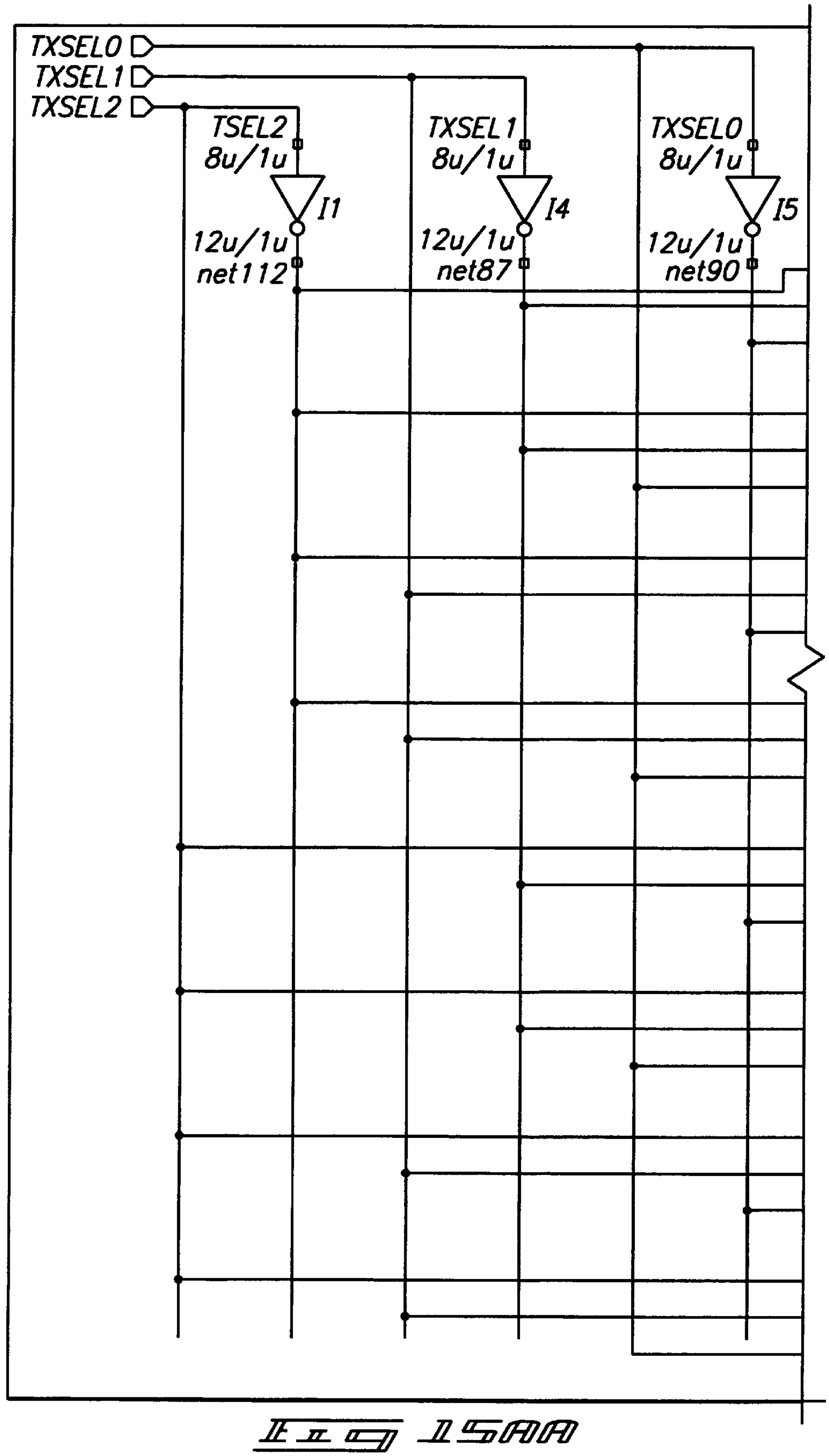
Figure 15A:
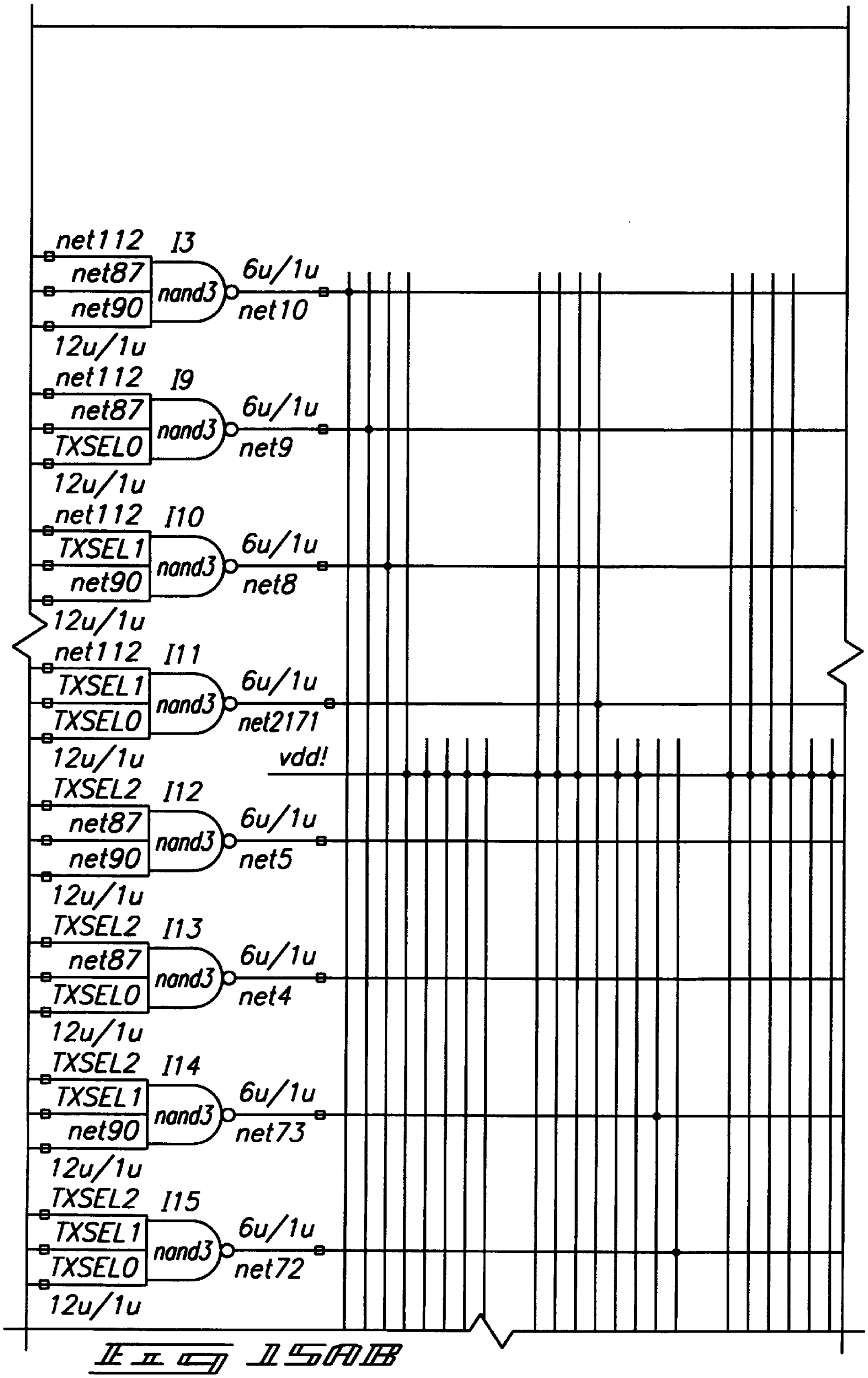
Figure 15A:
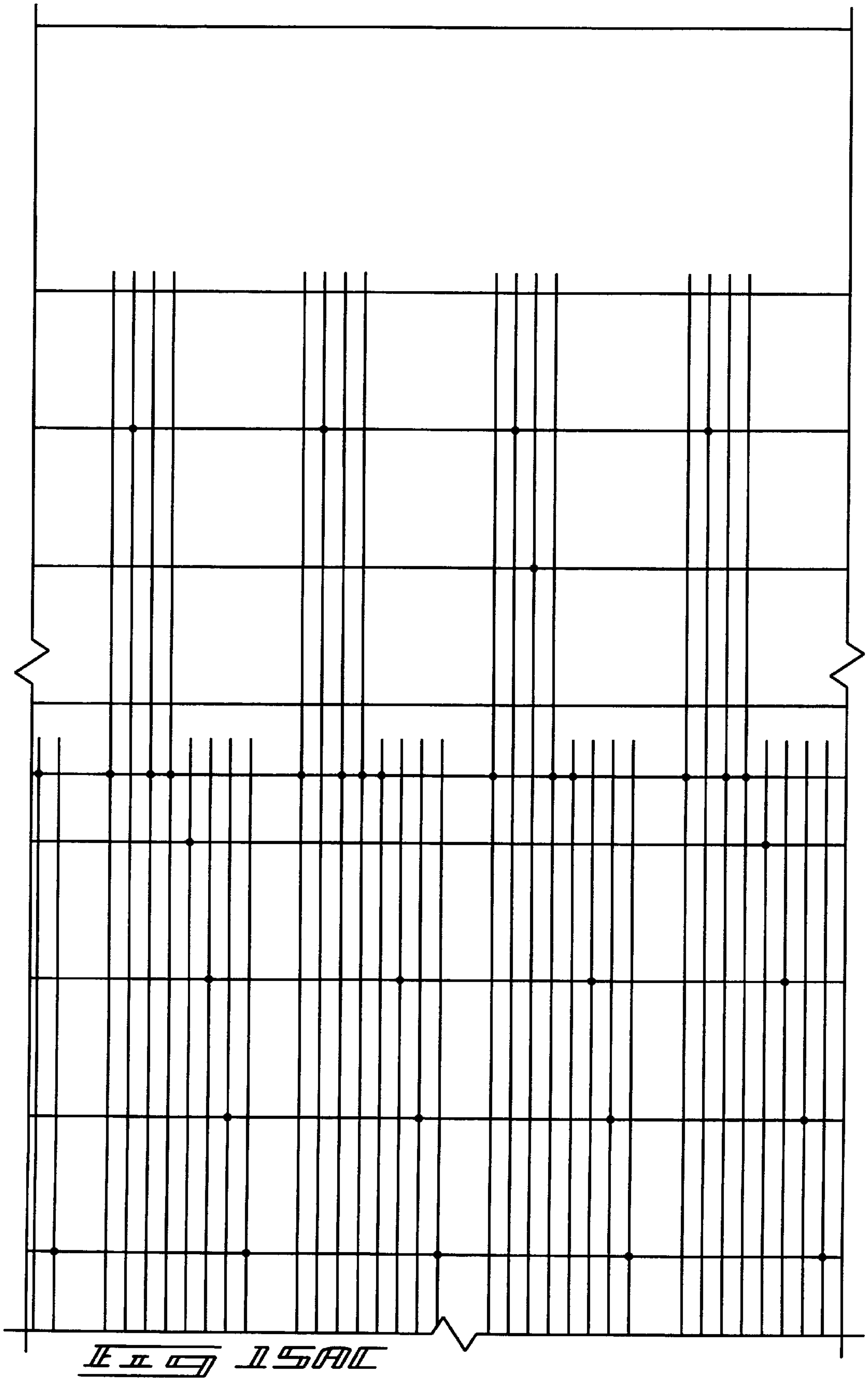
Figure 15A:
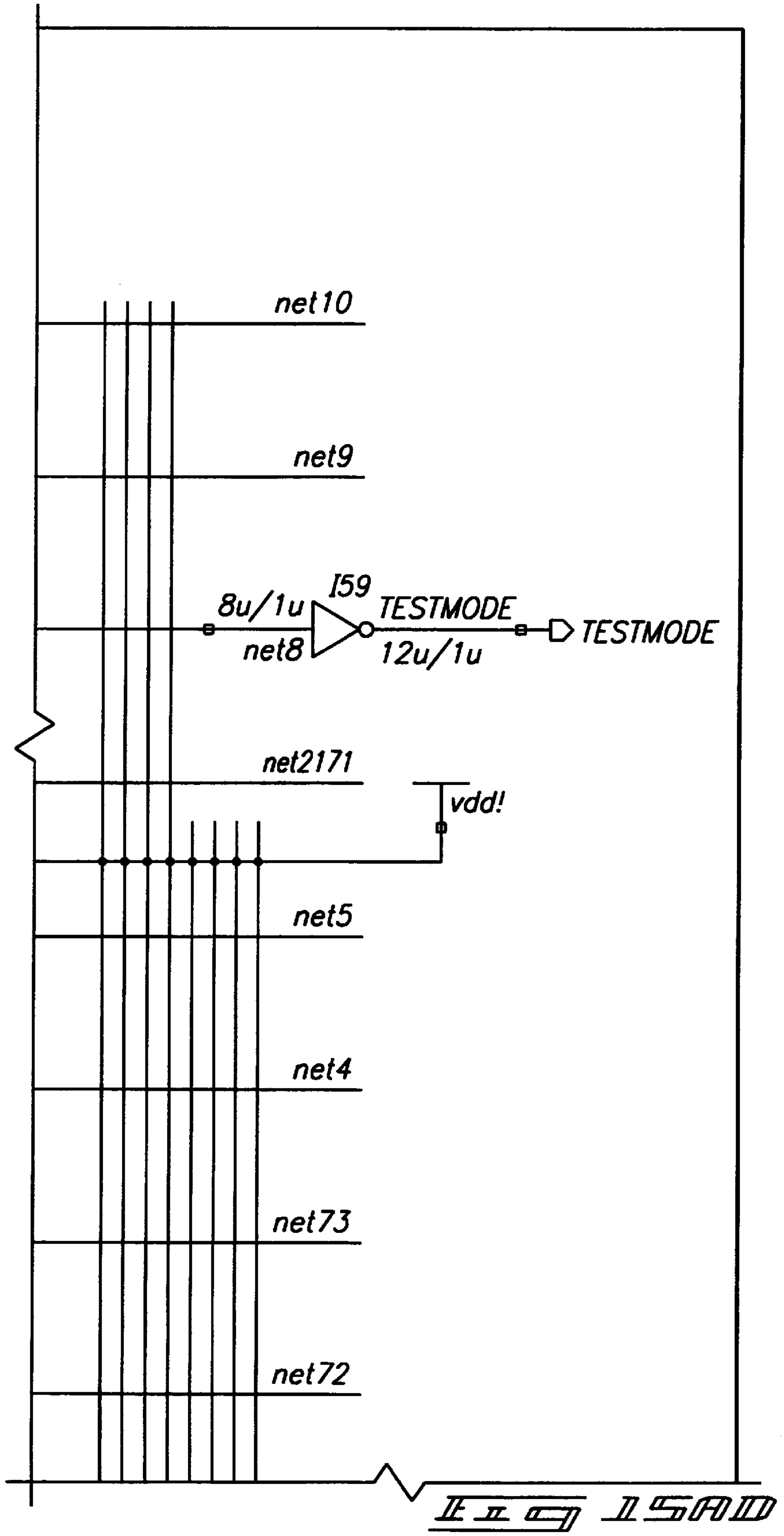
Figure 15B:
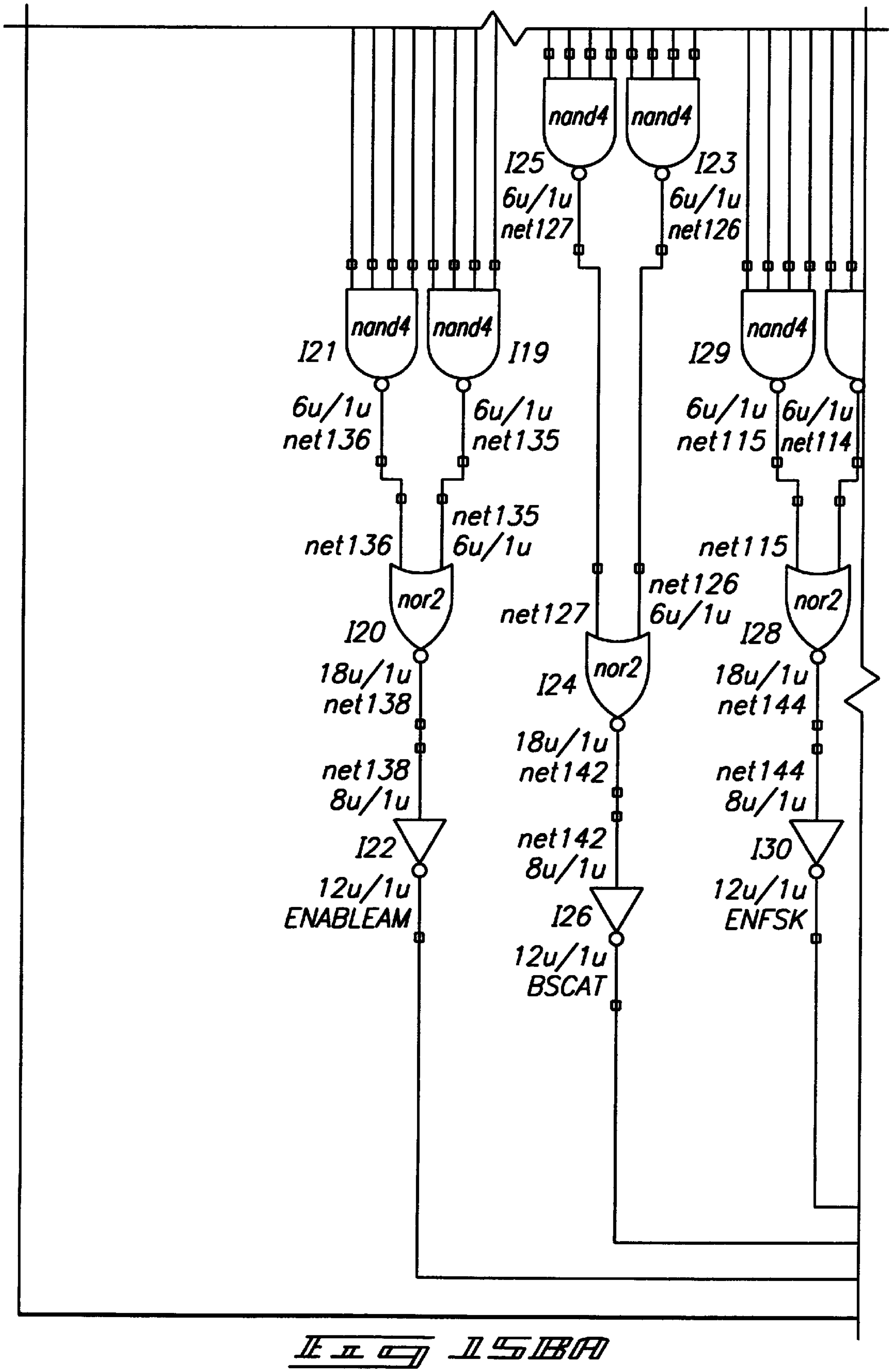
Figure 15B:
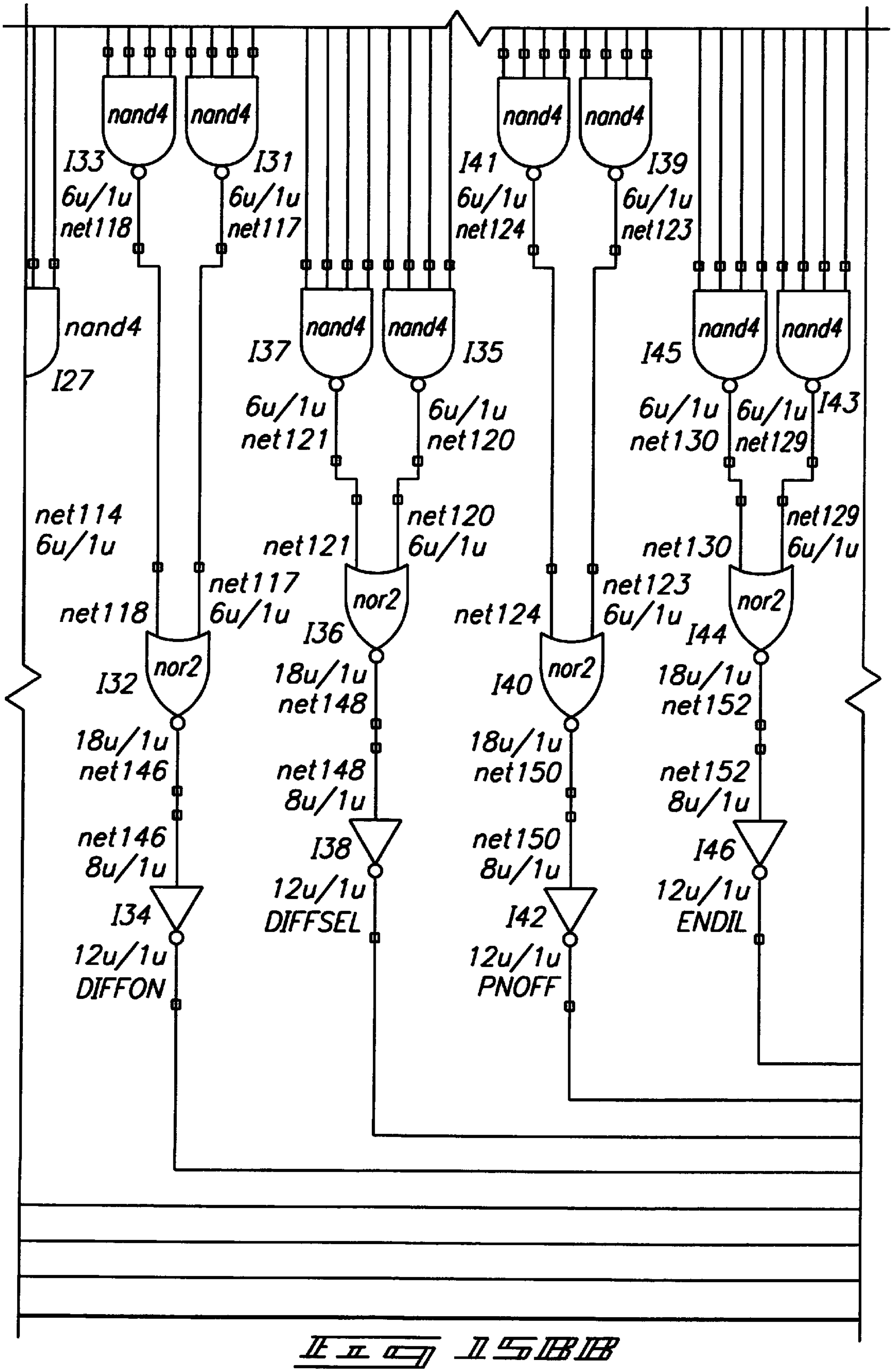
Figure 15B:
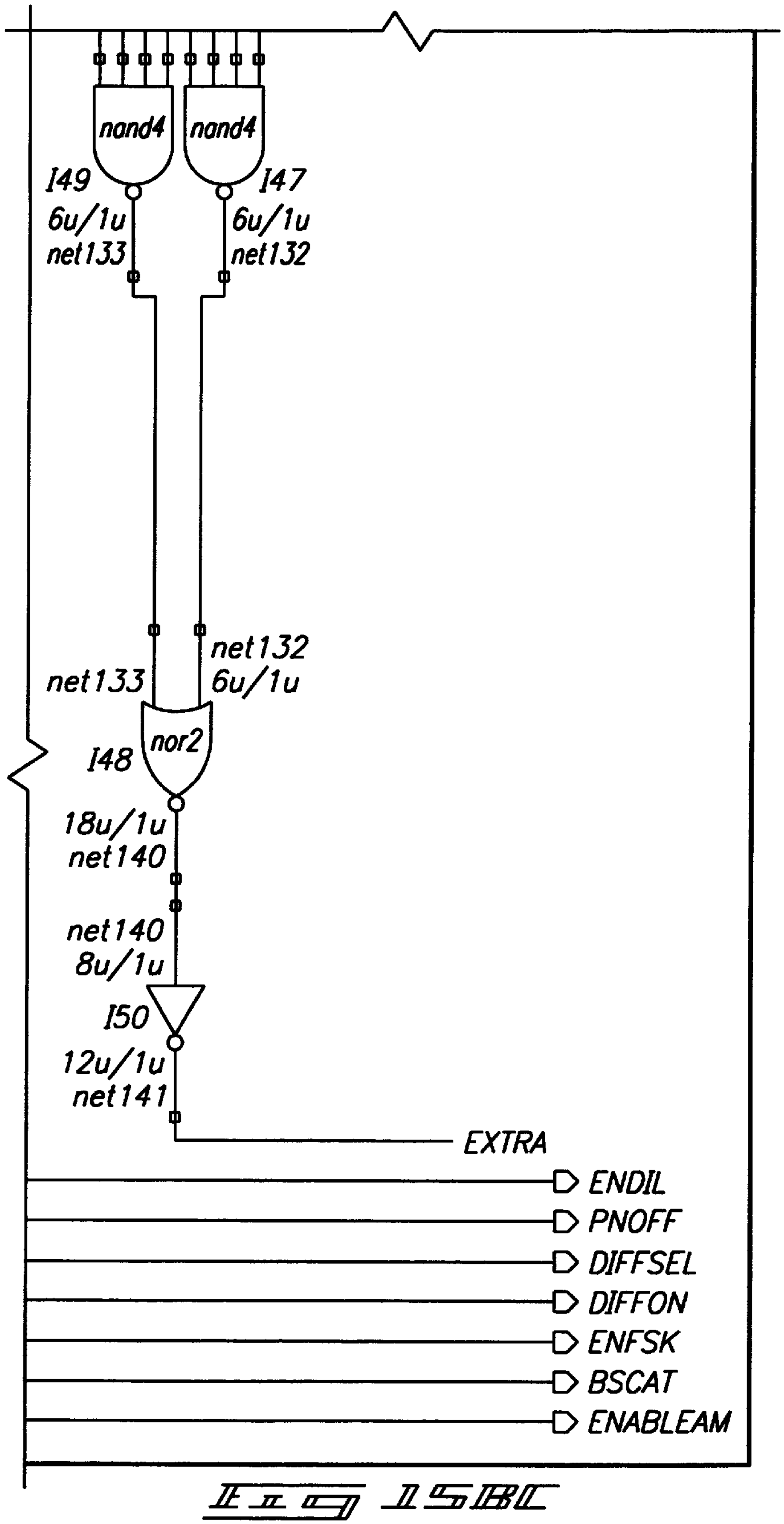

FIG. 15 is a graph illustrating how FIGS. 15AA–BC are to be assembled. After such assembly, FIGS. 15AA–BC provide a circuit drawing of return link configuration control logic "rlconfig" included in the circuit of FIGS. 6AA–EK.

Figure 16A:
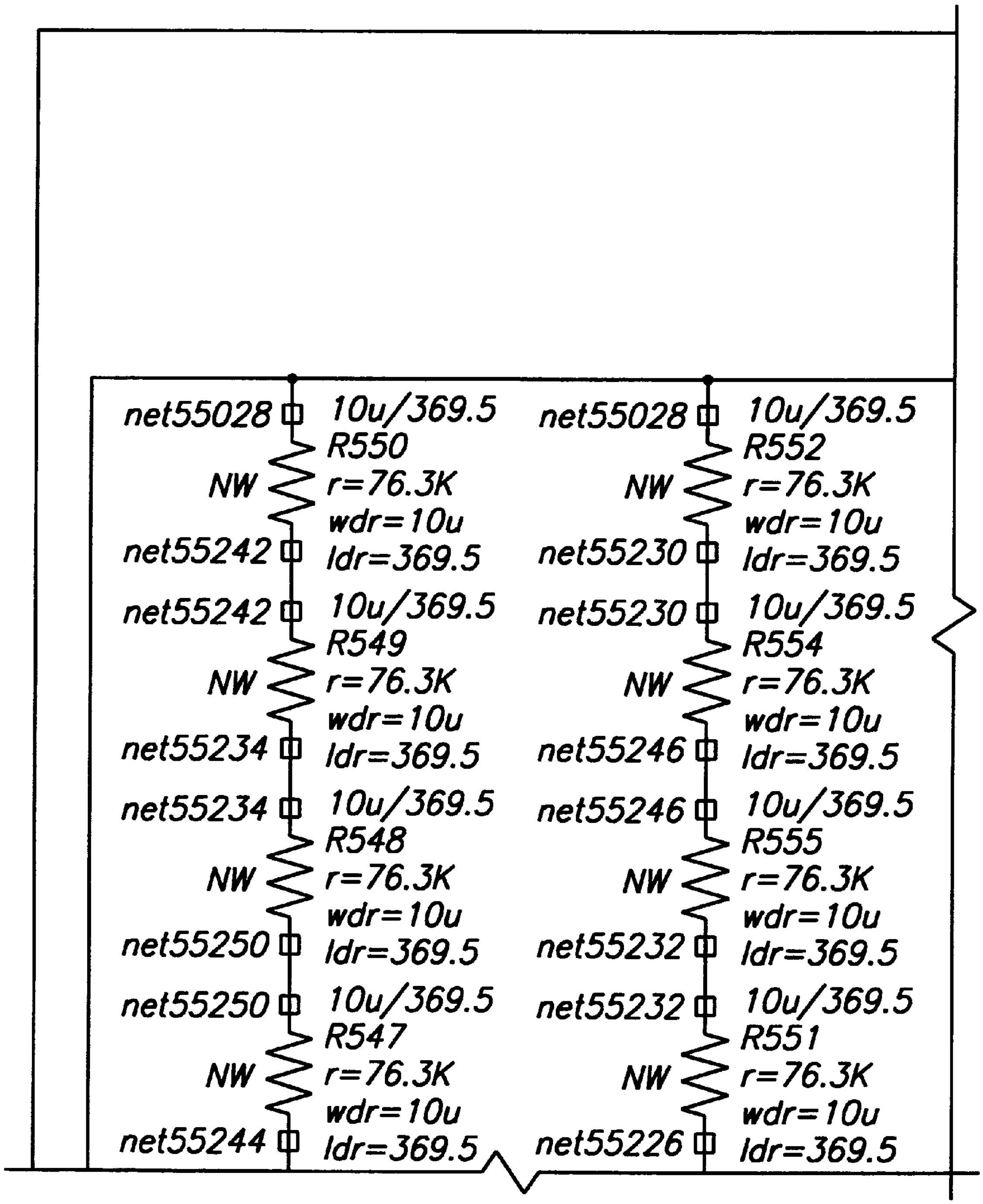
Figure 16A:
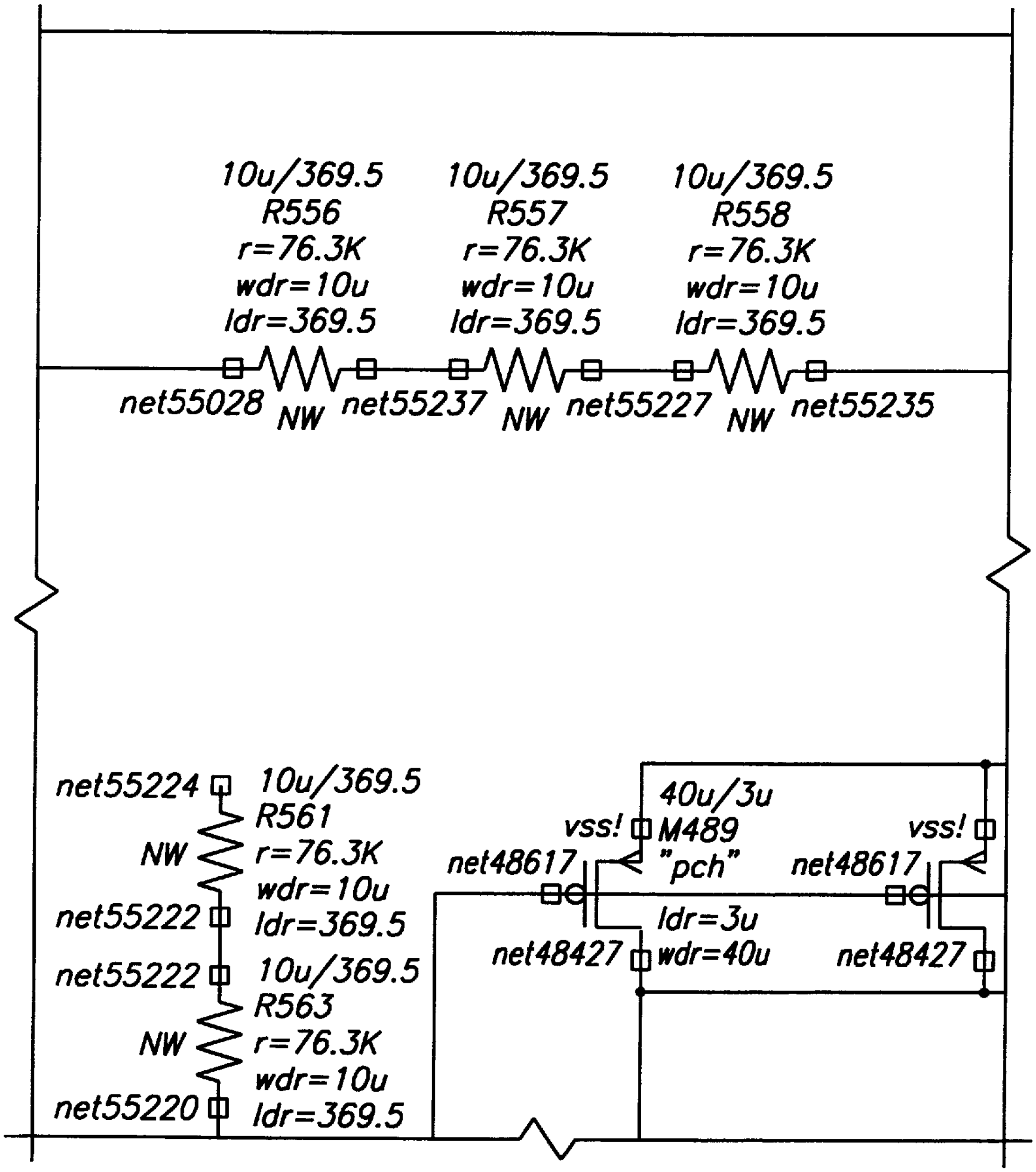
Figure 16A:
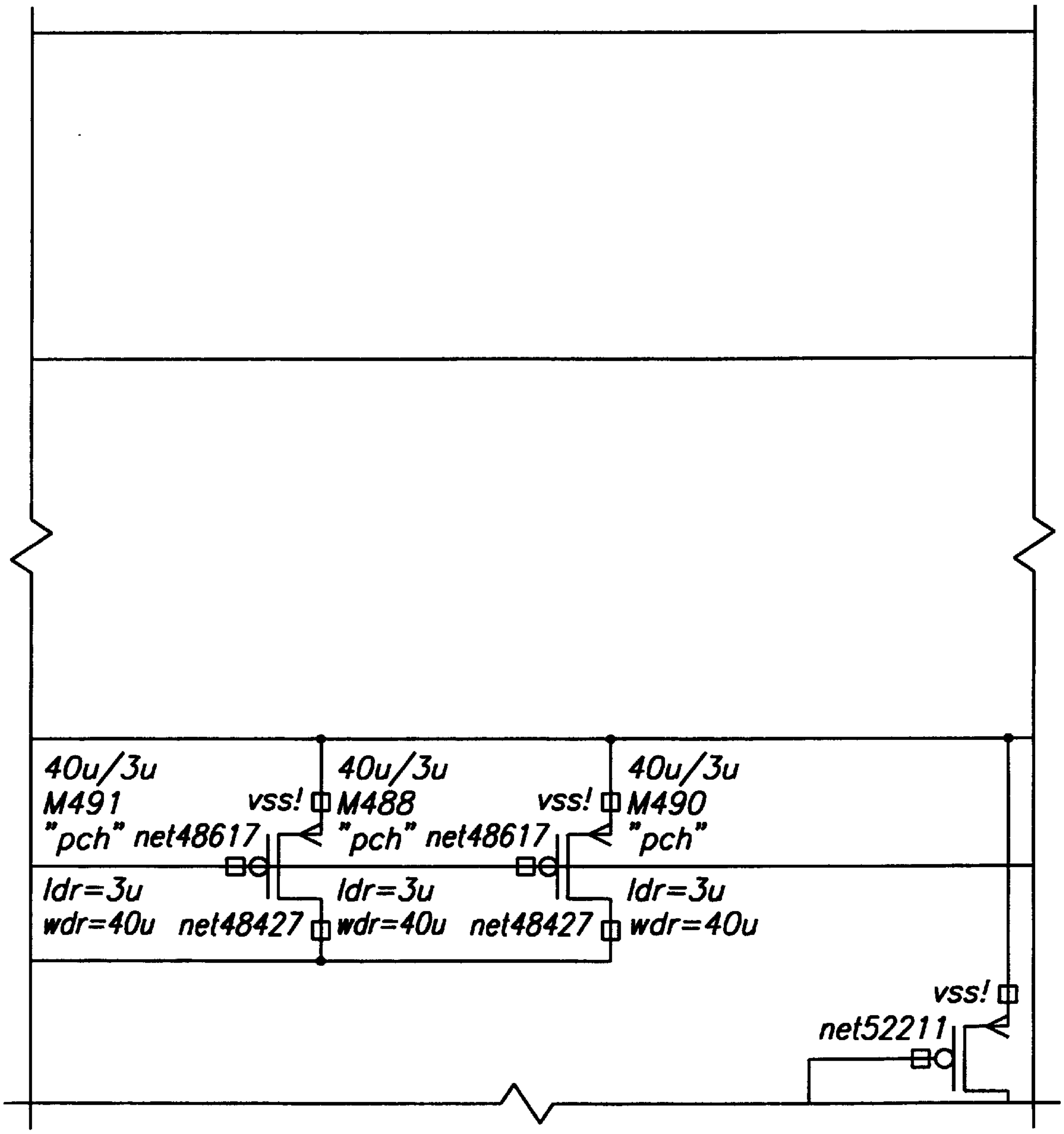
Figure 16A:
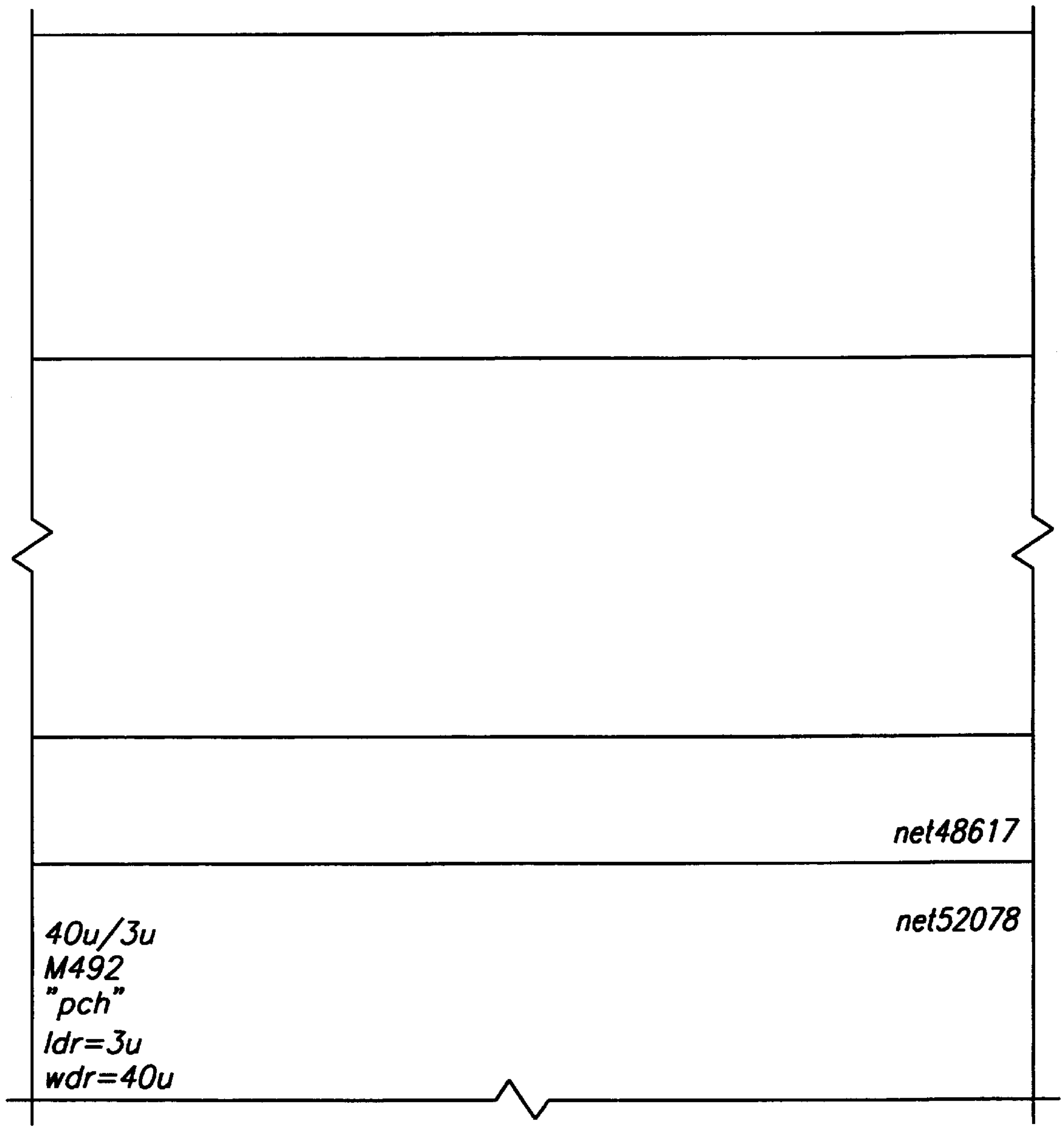
Figure 16A:
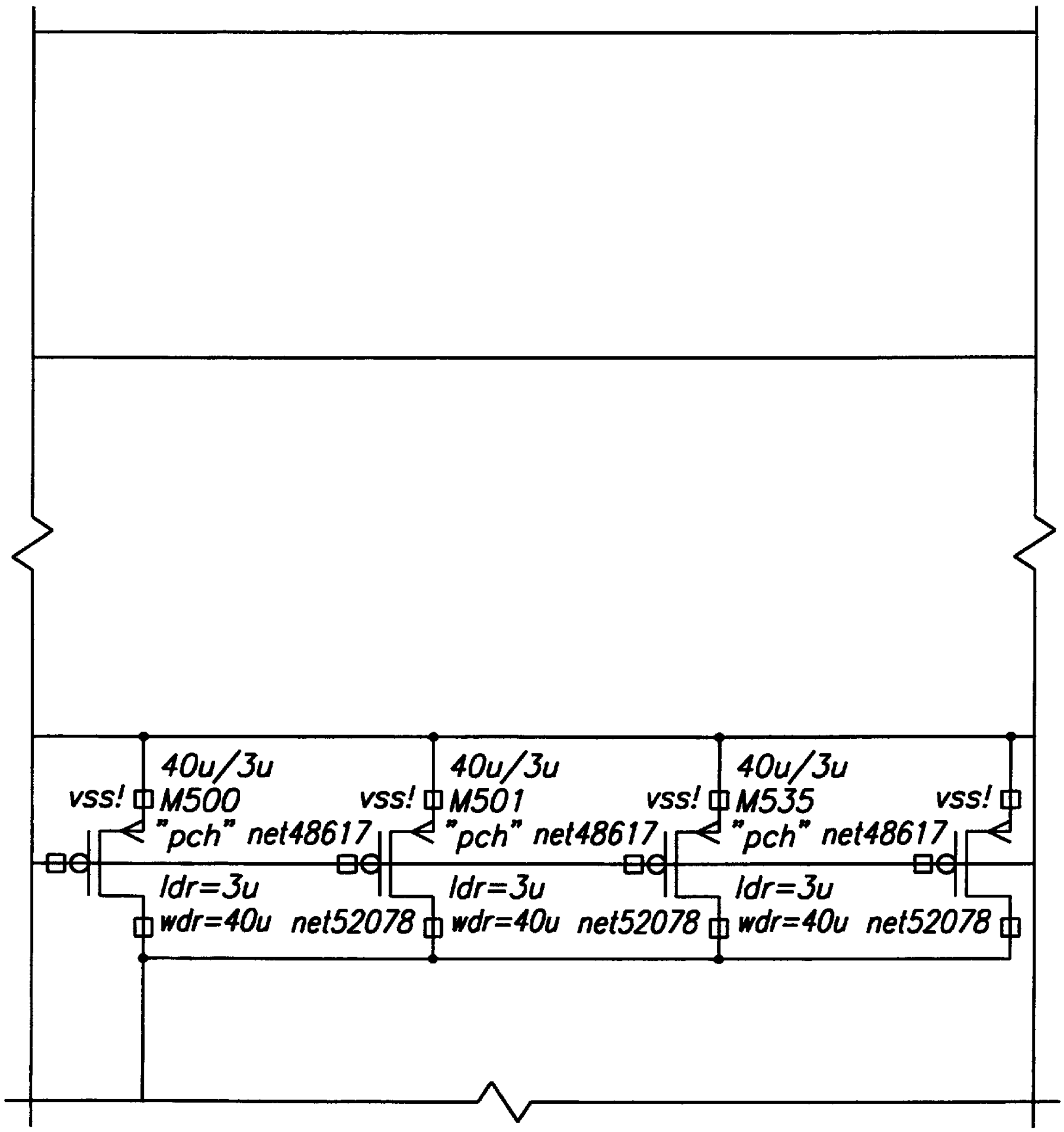
Figure 16A:
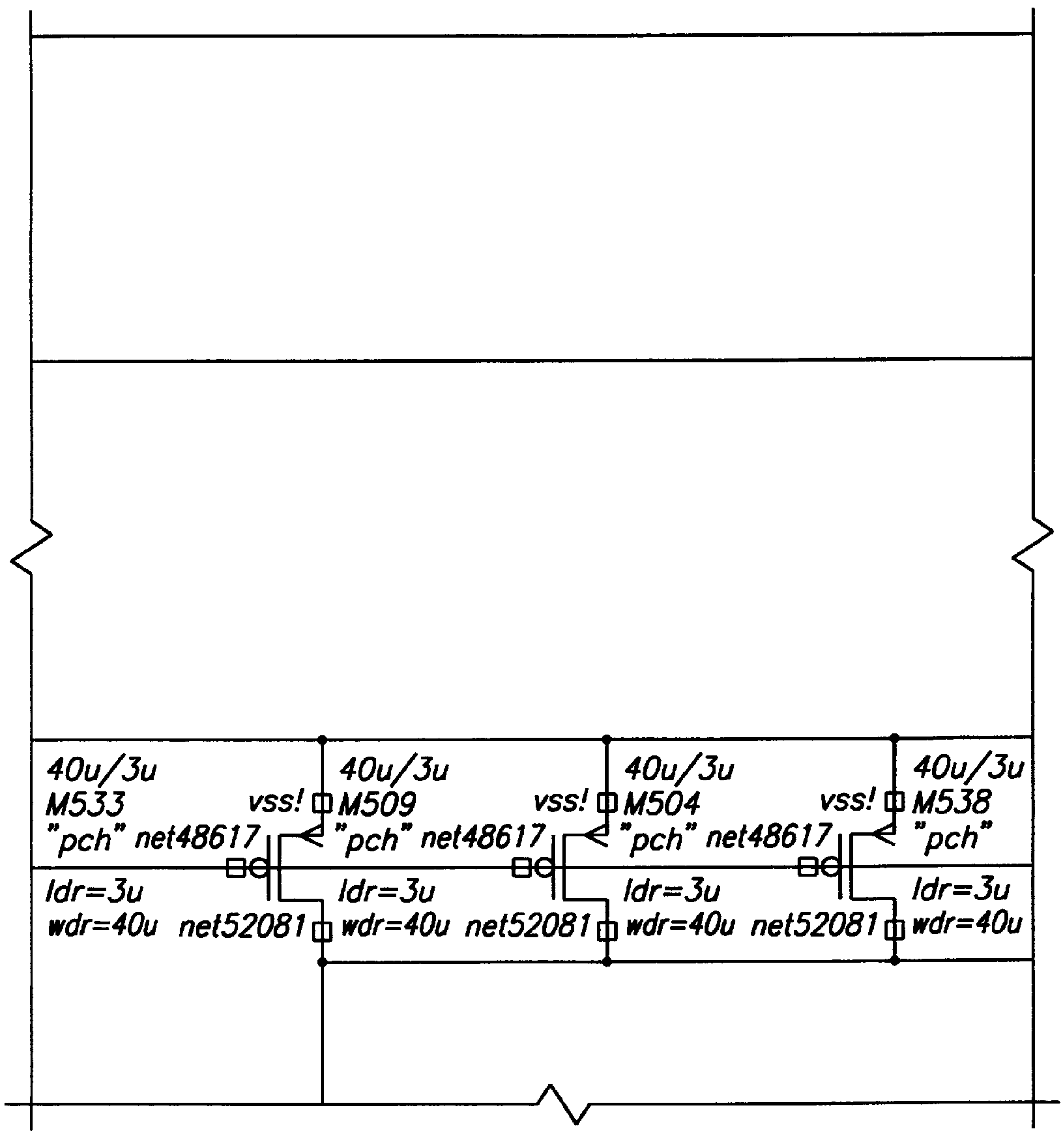
Figure 16A:
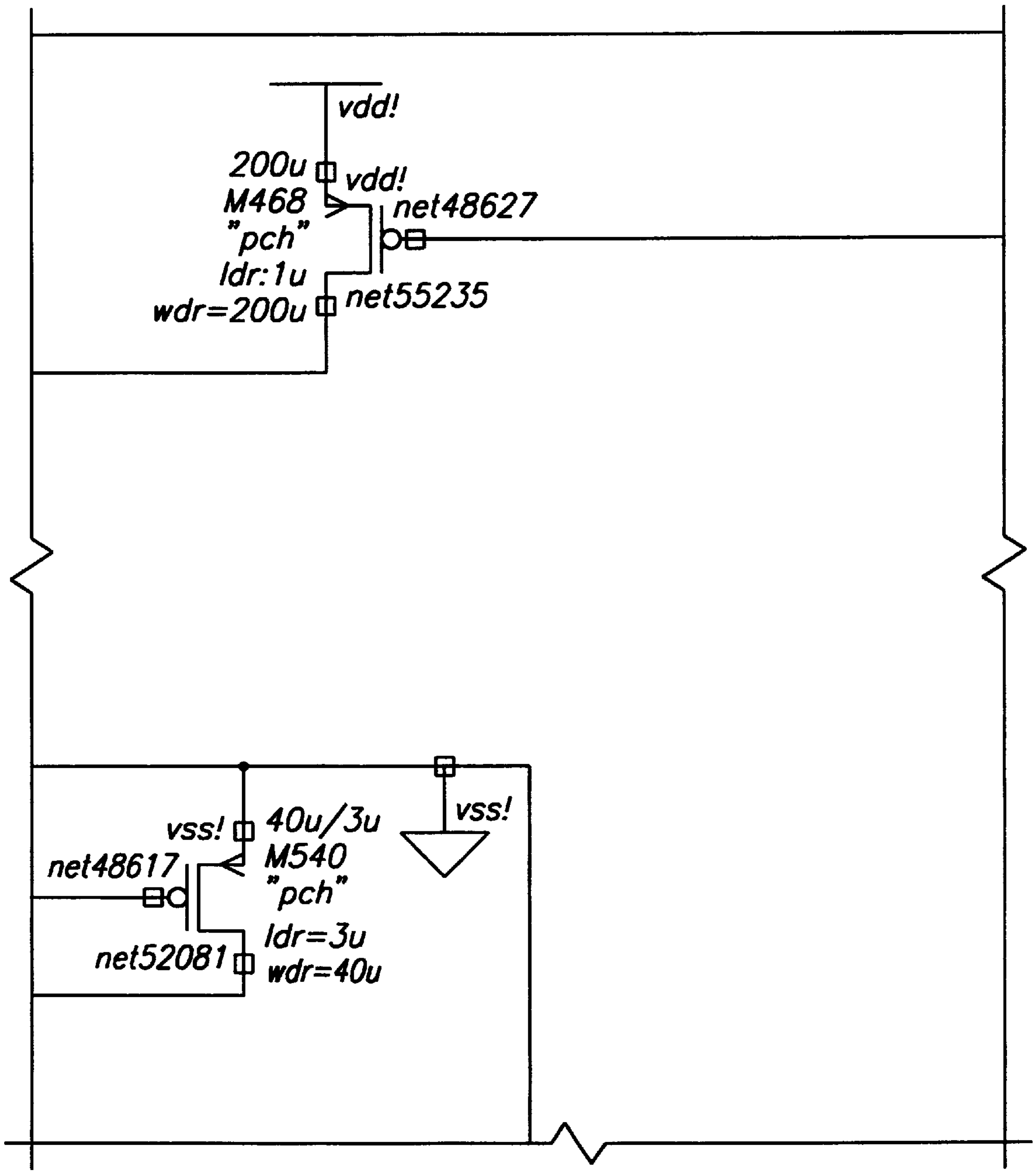
Figure 16A:
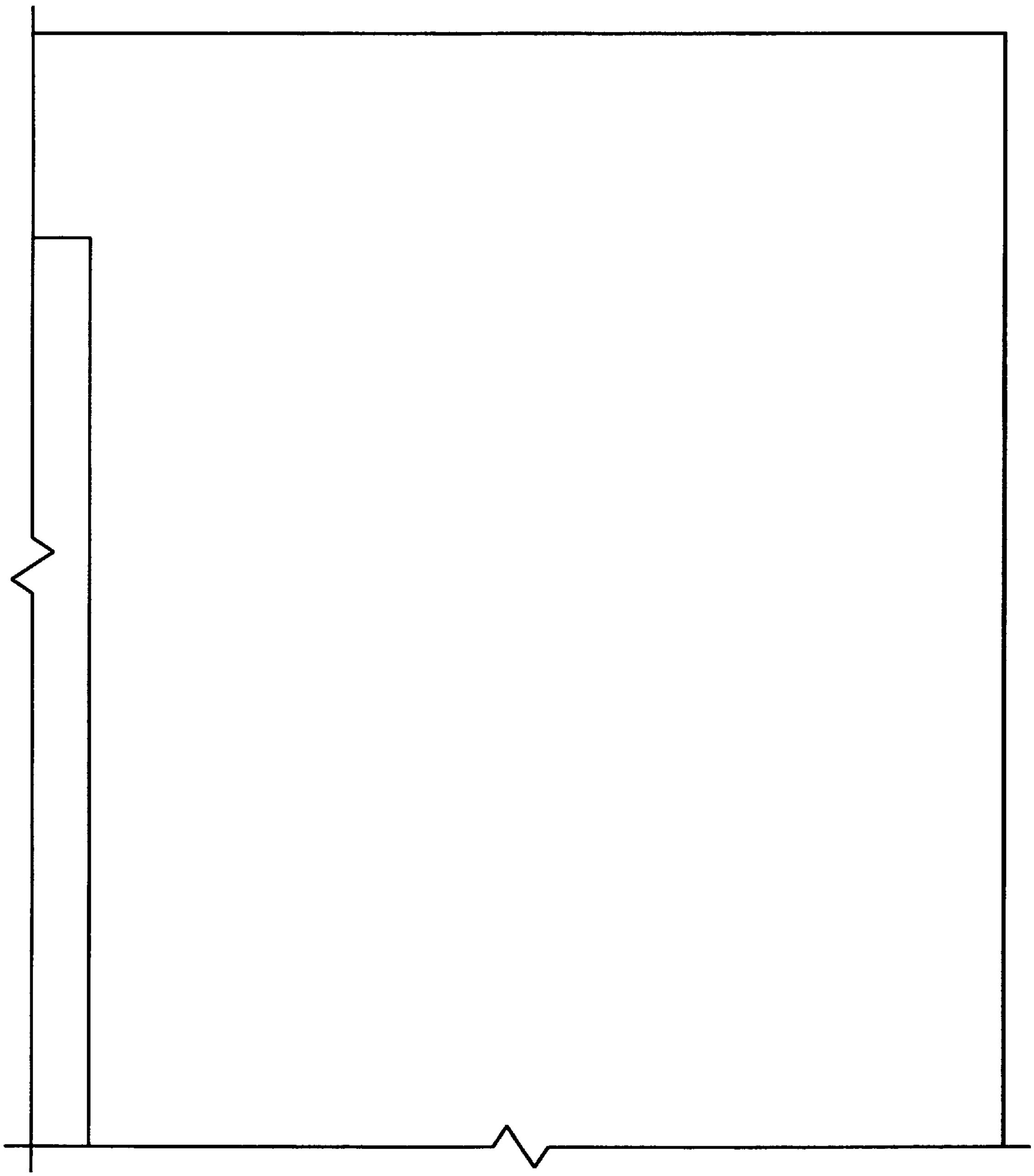
Figure 16B:
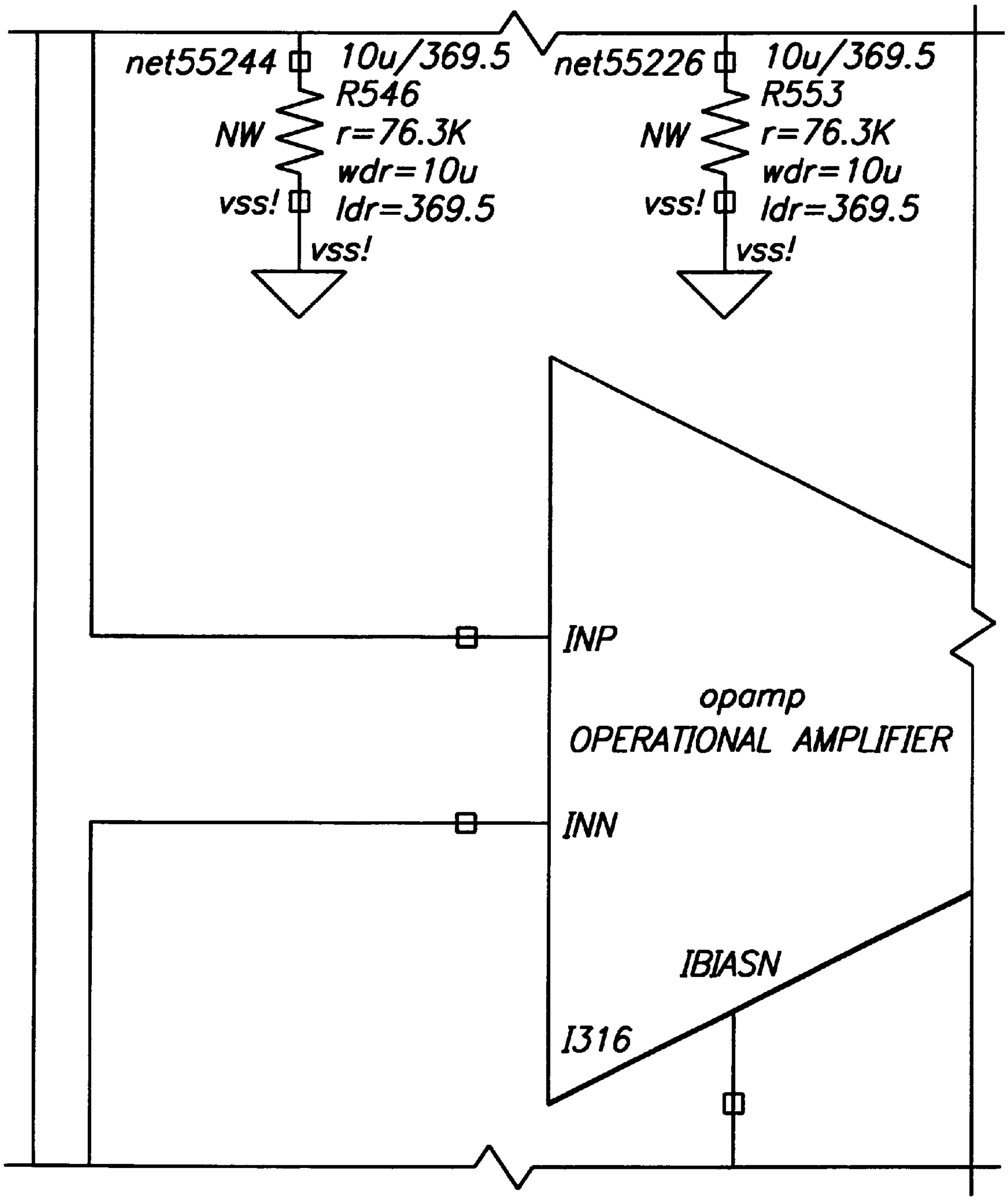
Figure 16B:
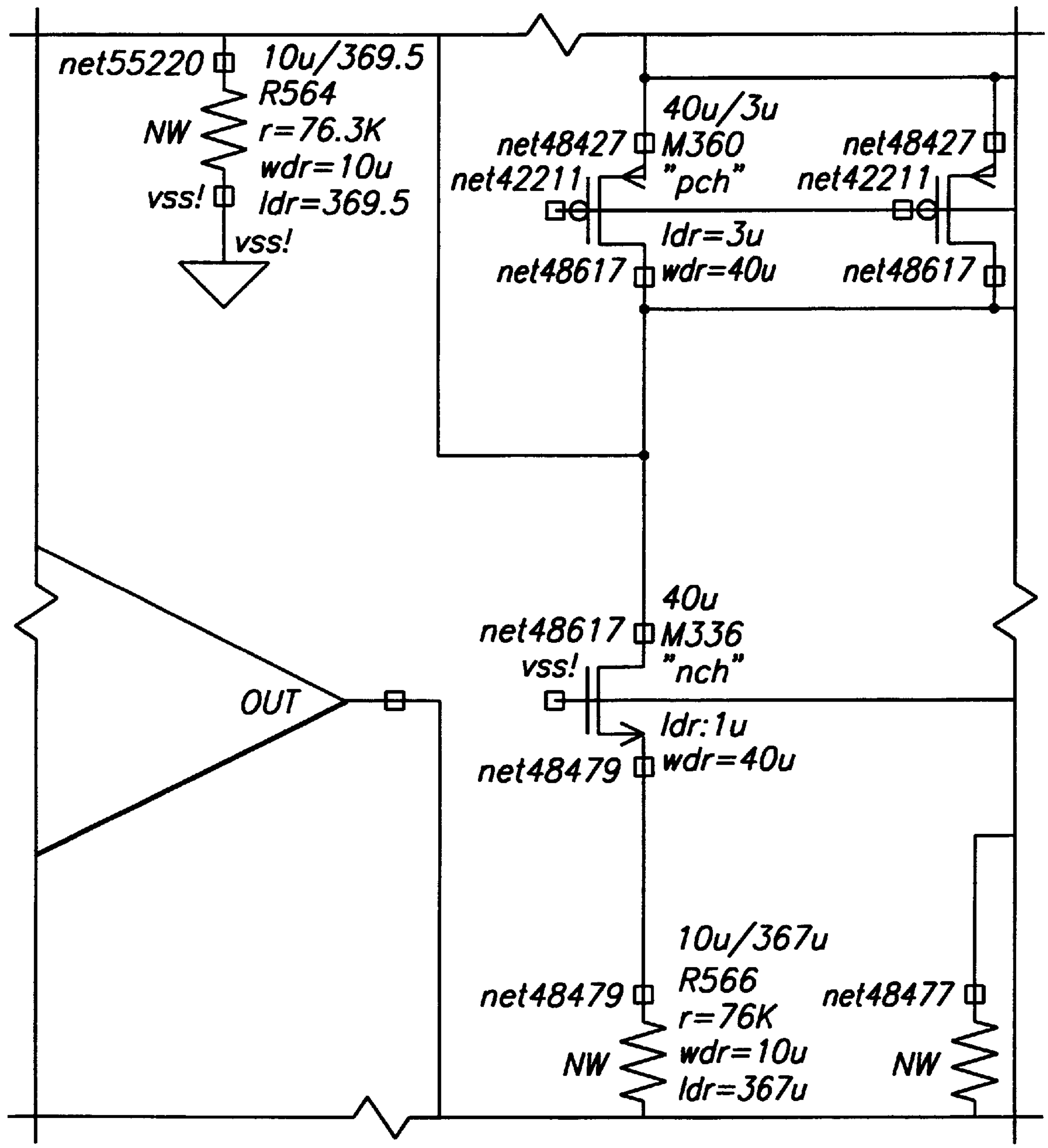
Figure 16B:
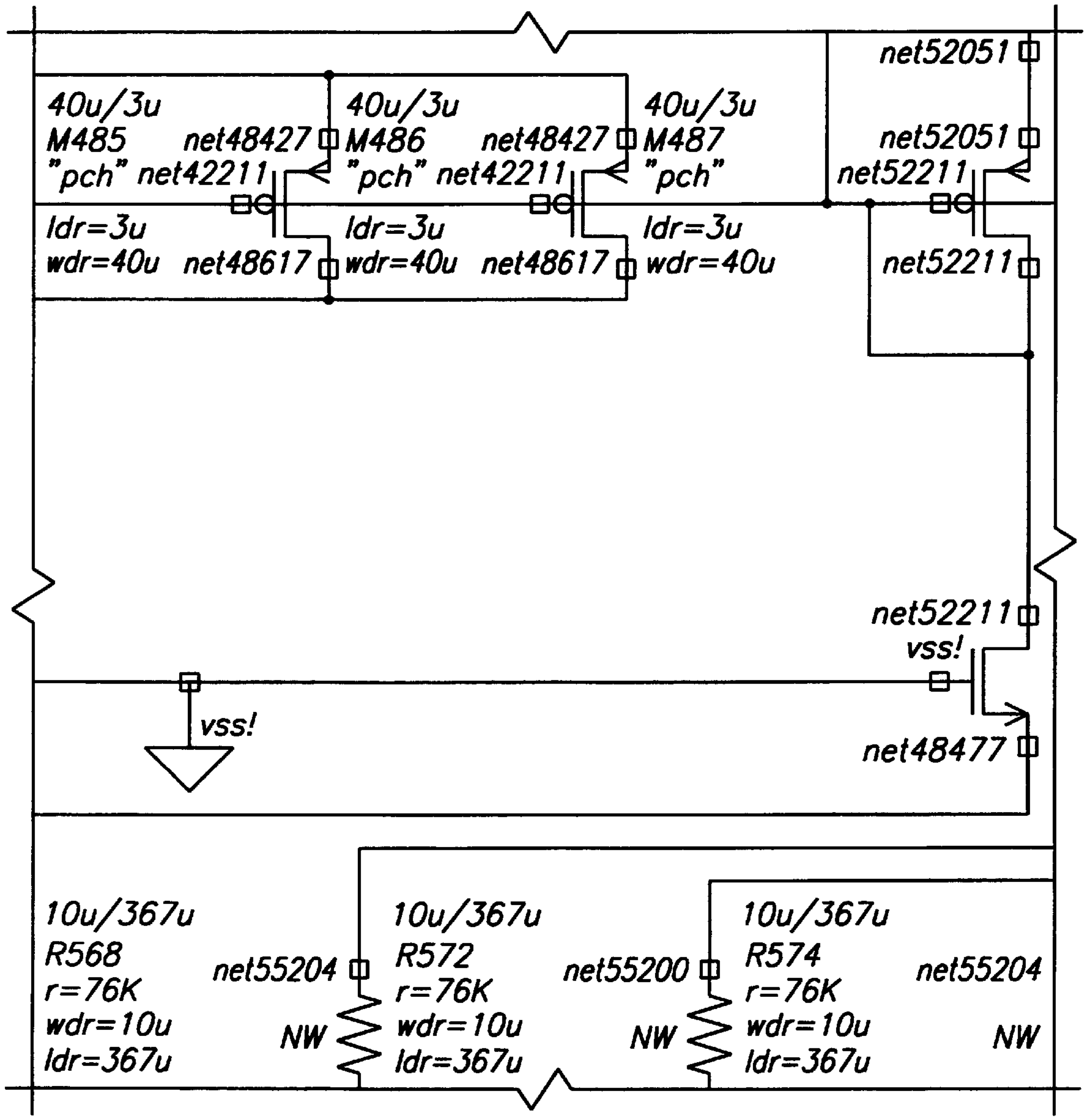
Figure 16B:
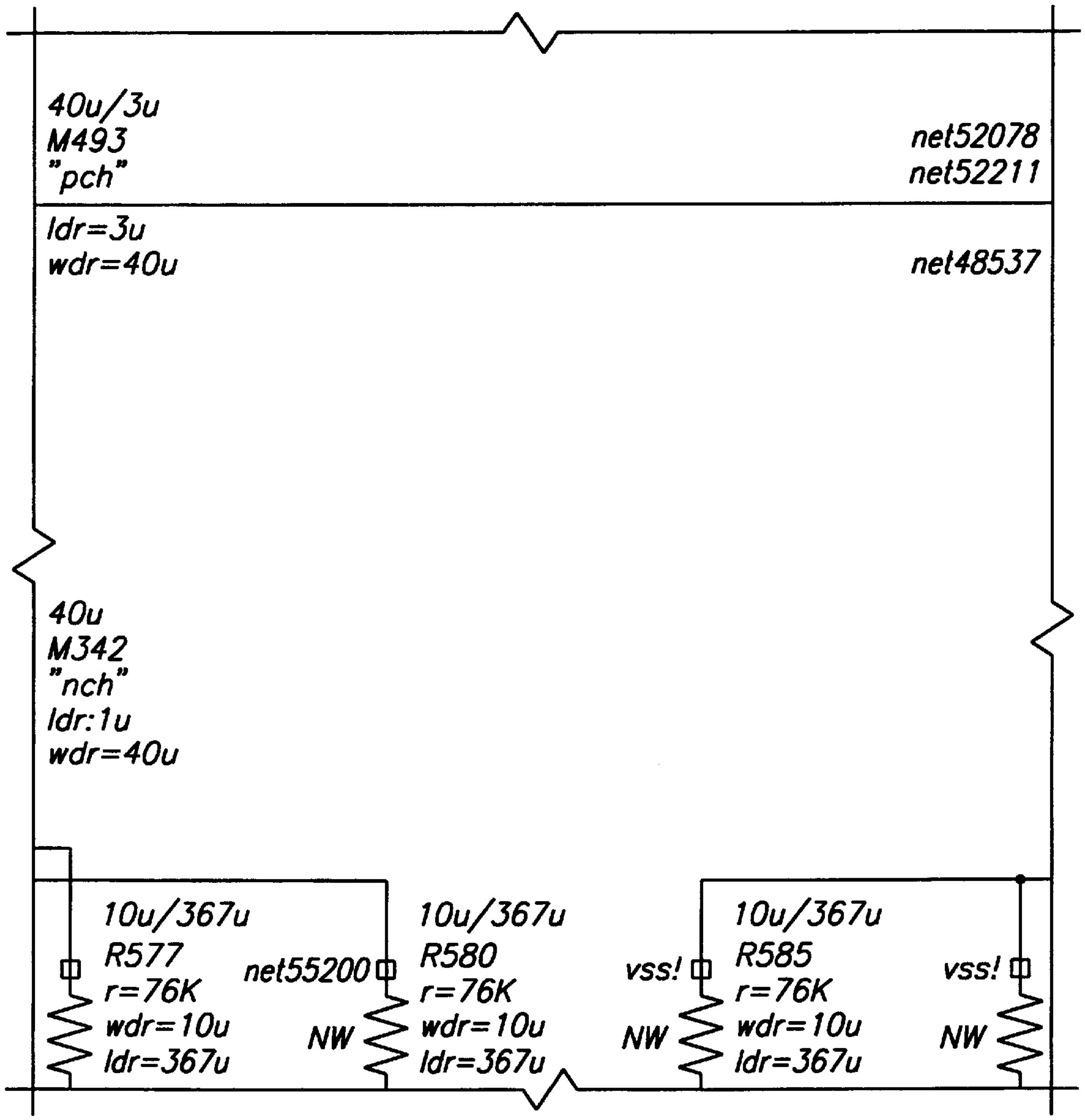
Figure 16B:
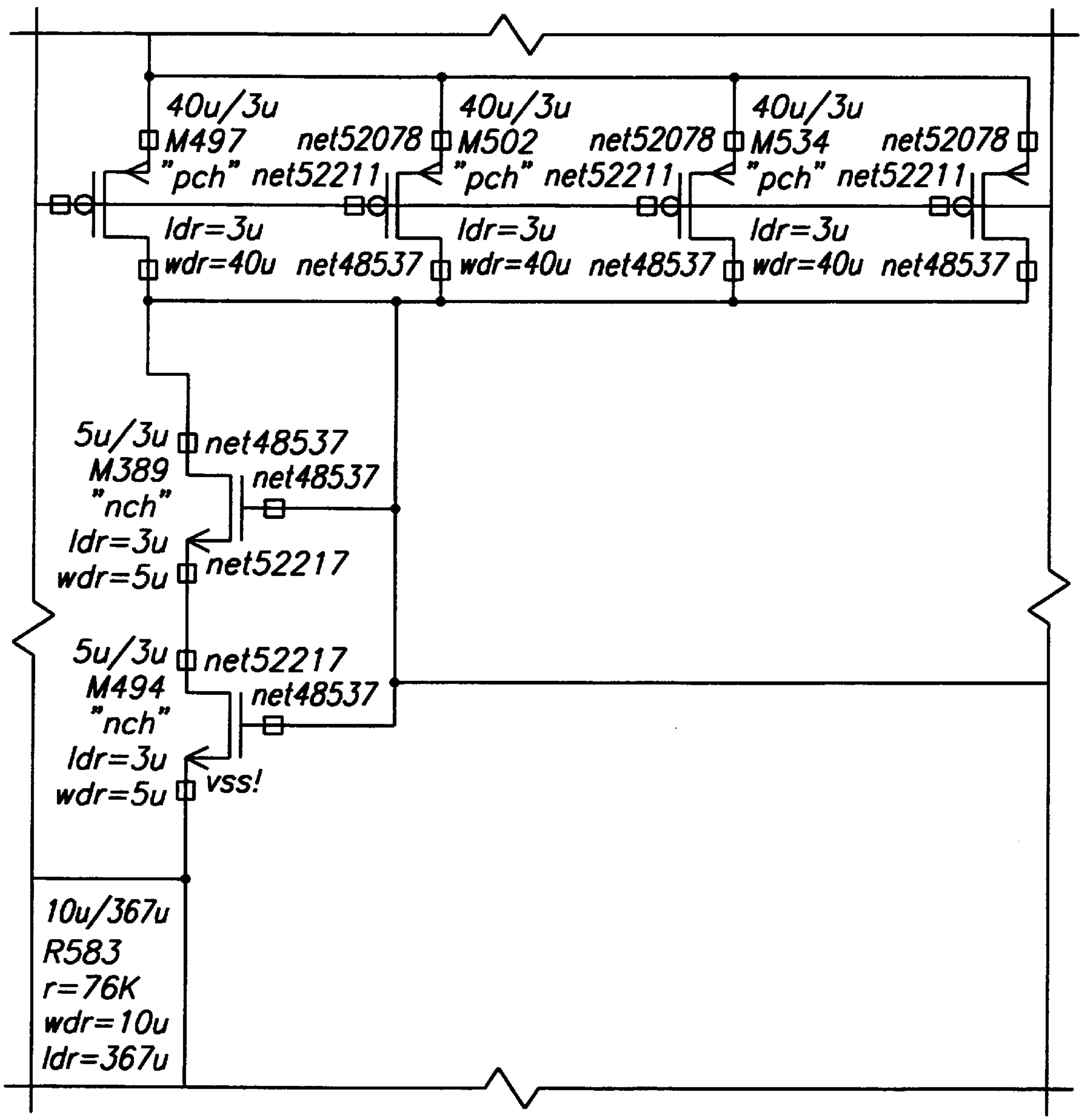
Figure 16B:
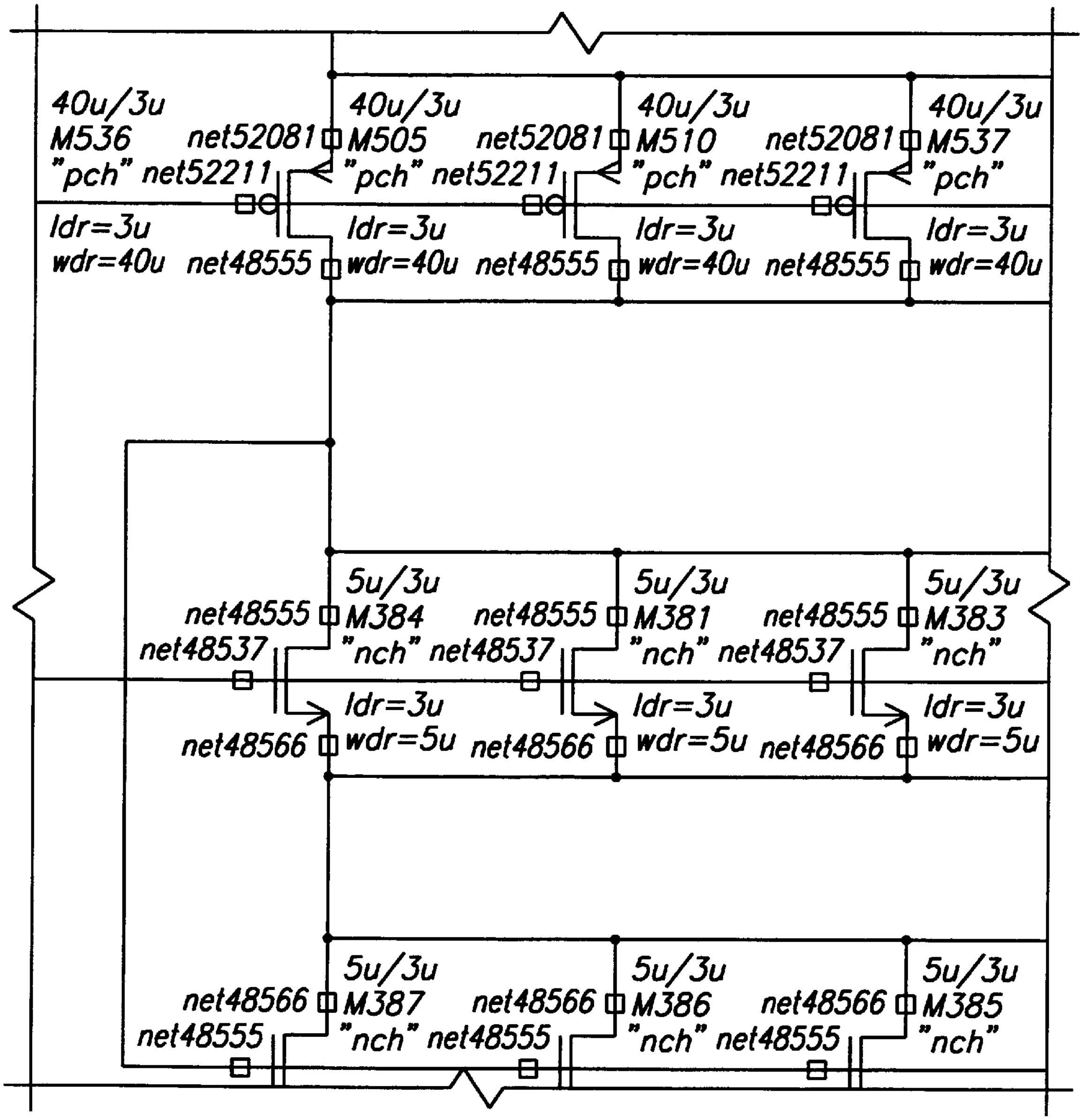
Figure 16B:
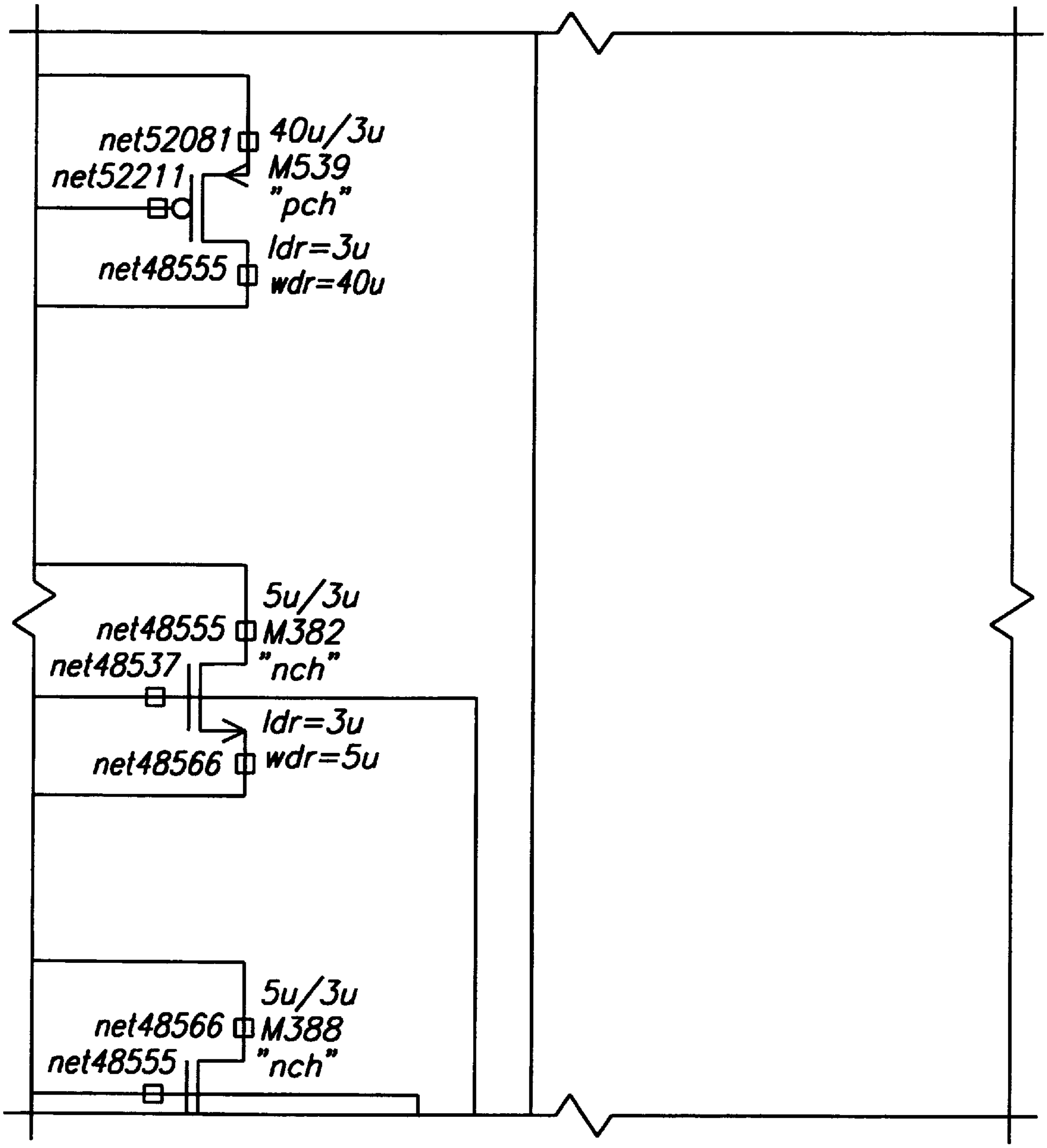
Figure 16B:
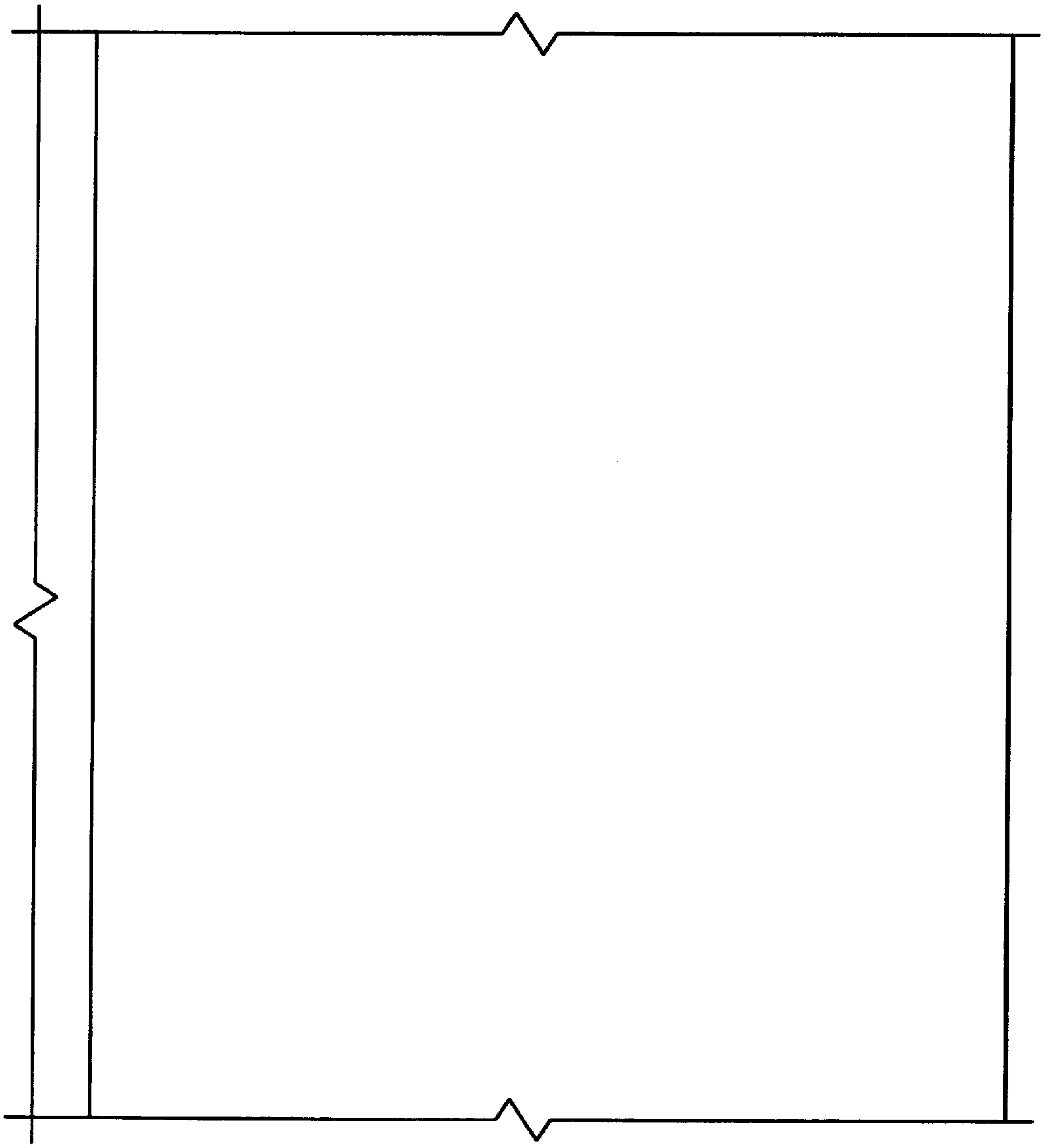
Figure 16C:
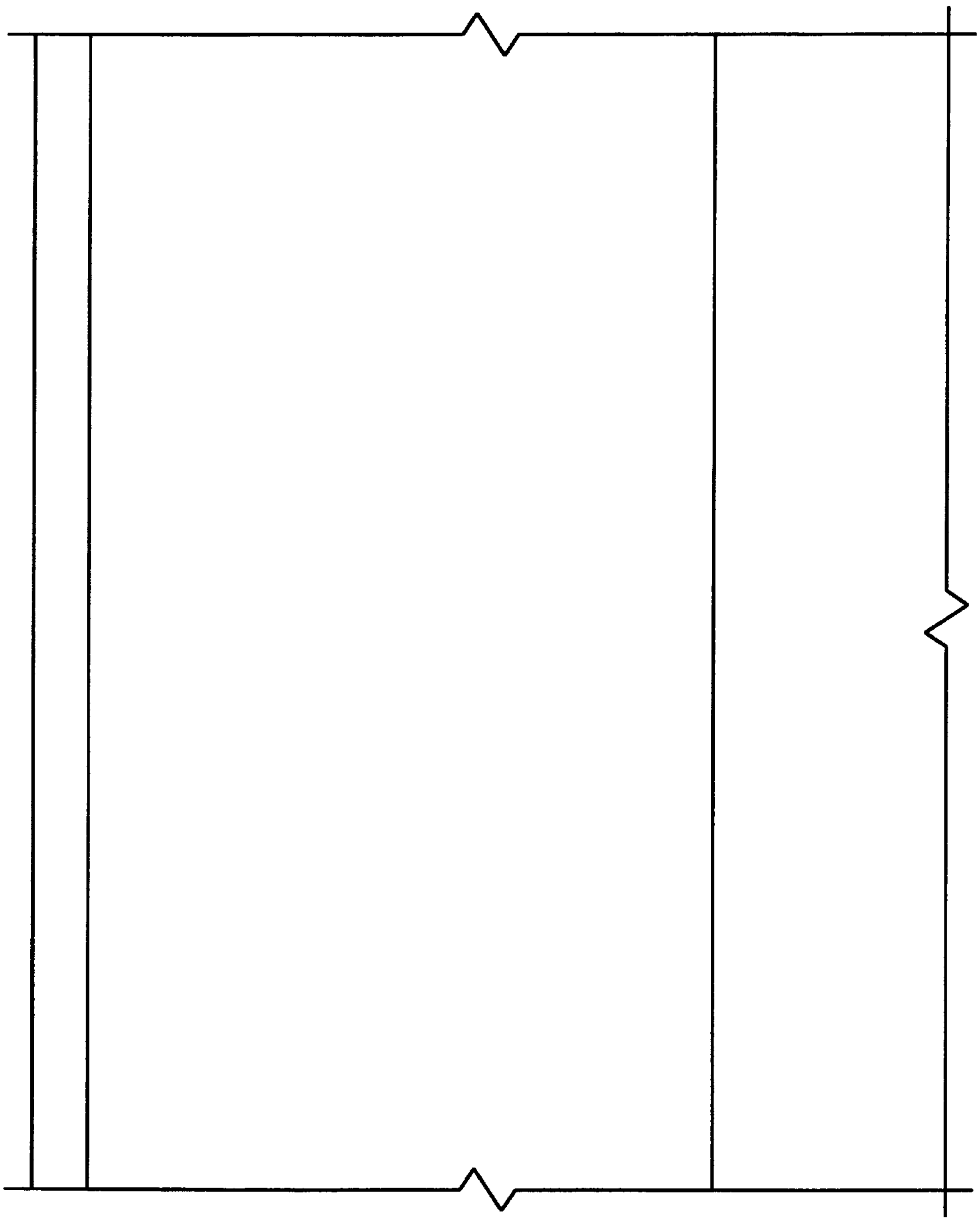
Figure 16C:
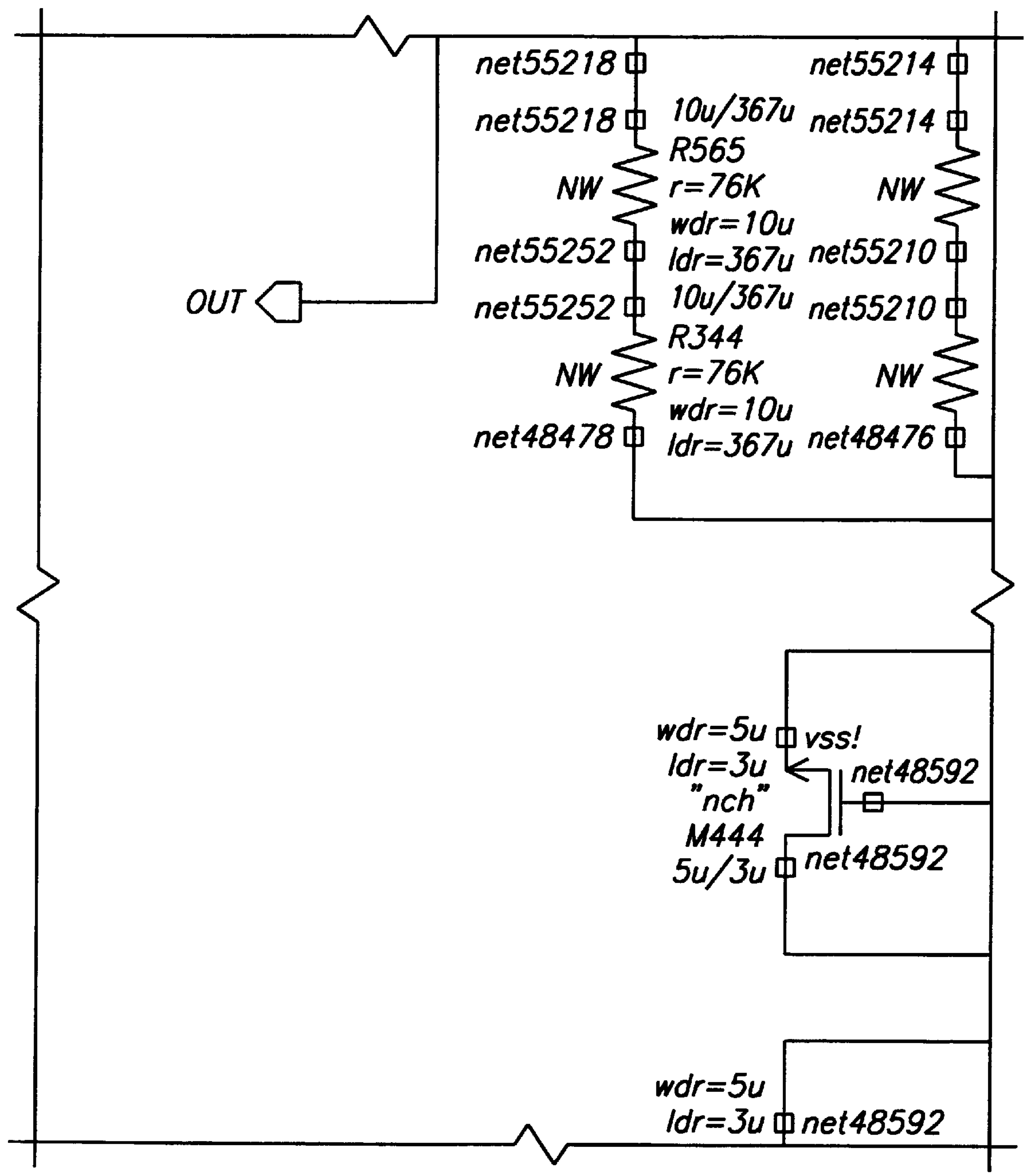
Figure 16C:
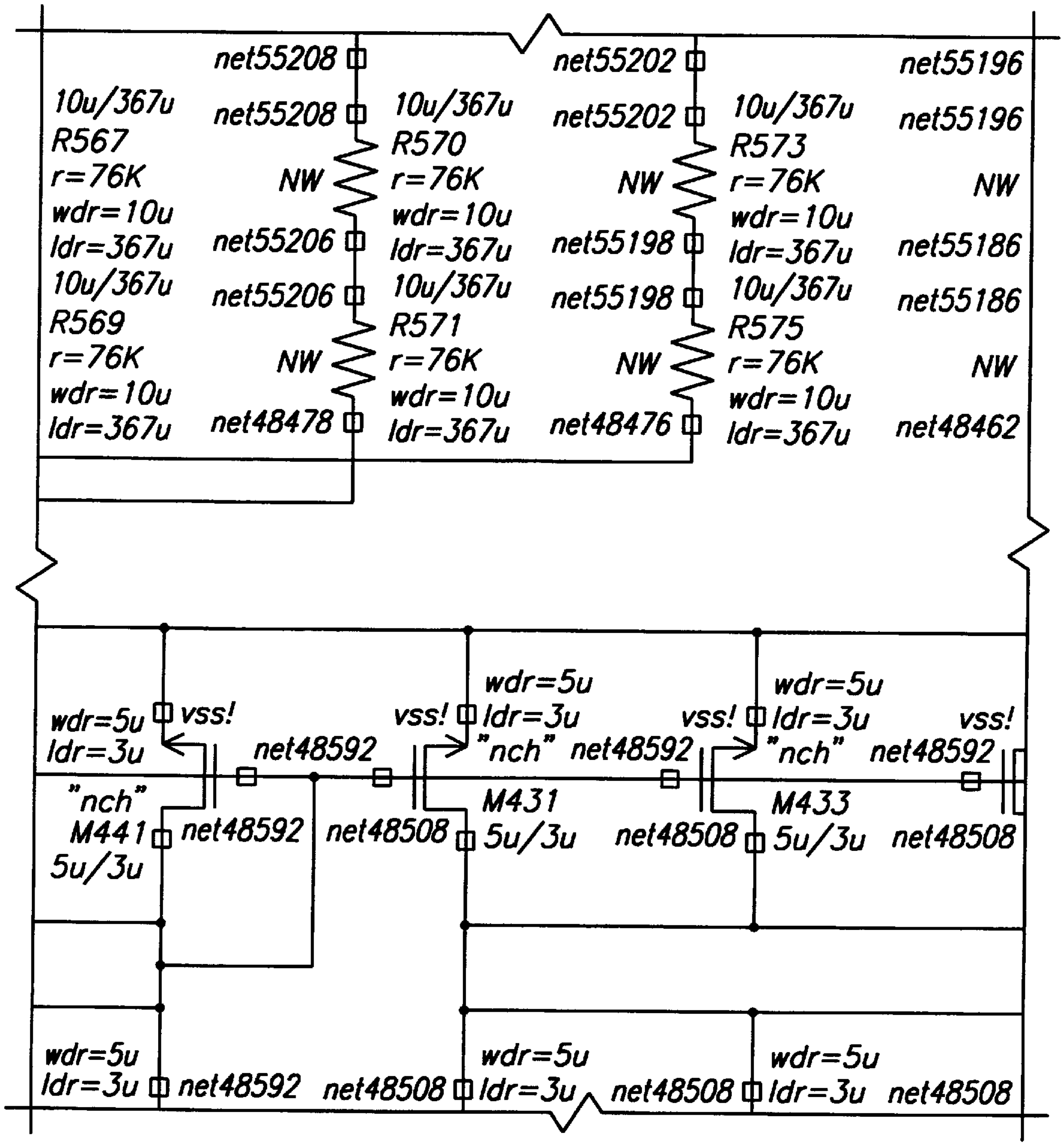
Figure 16C:
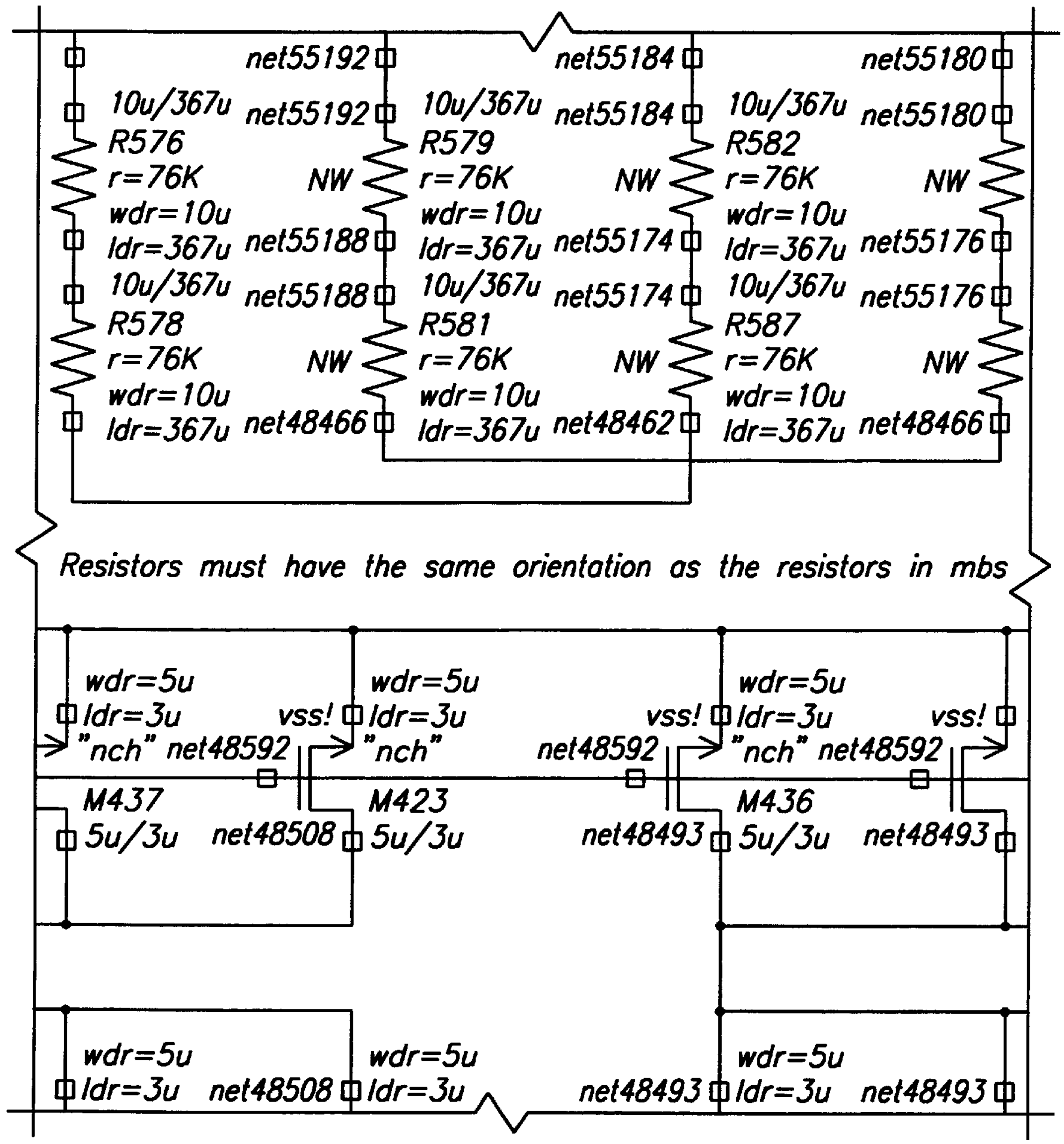
Figure 16C:
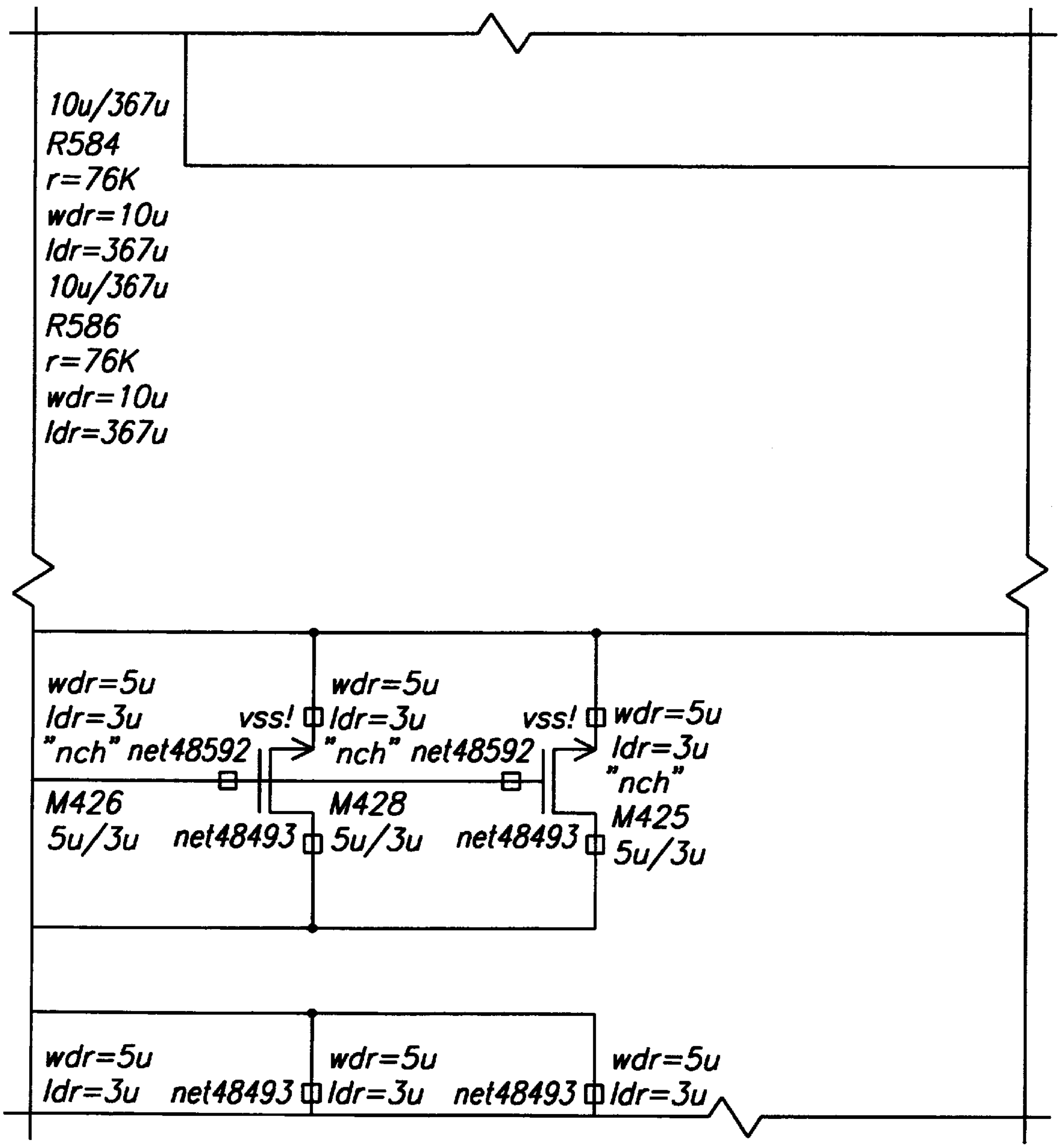
Figure 16C:
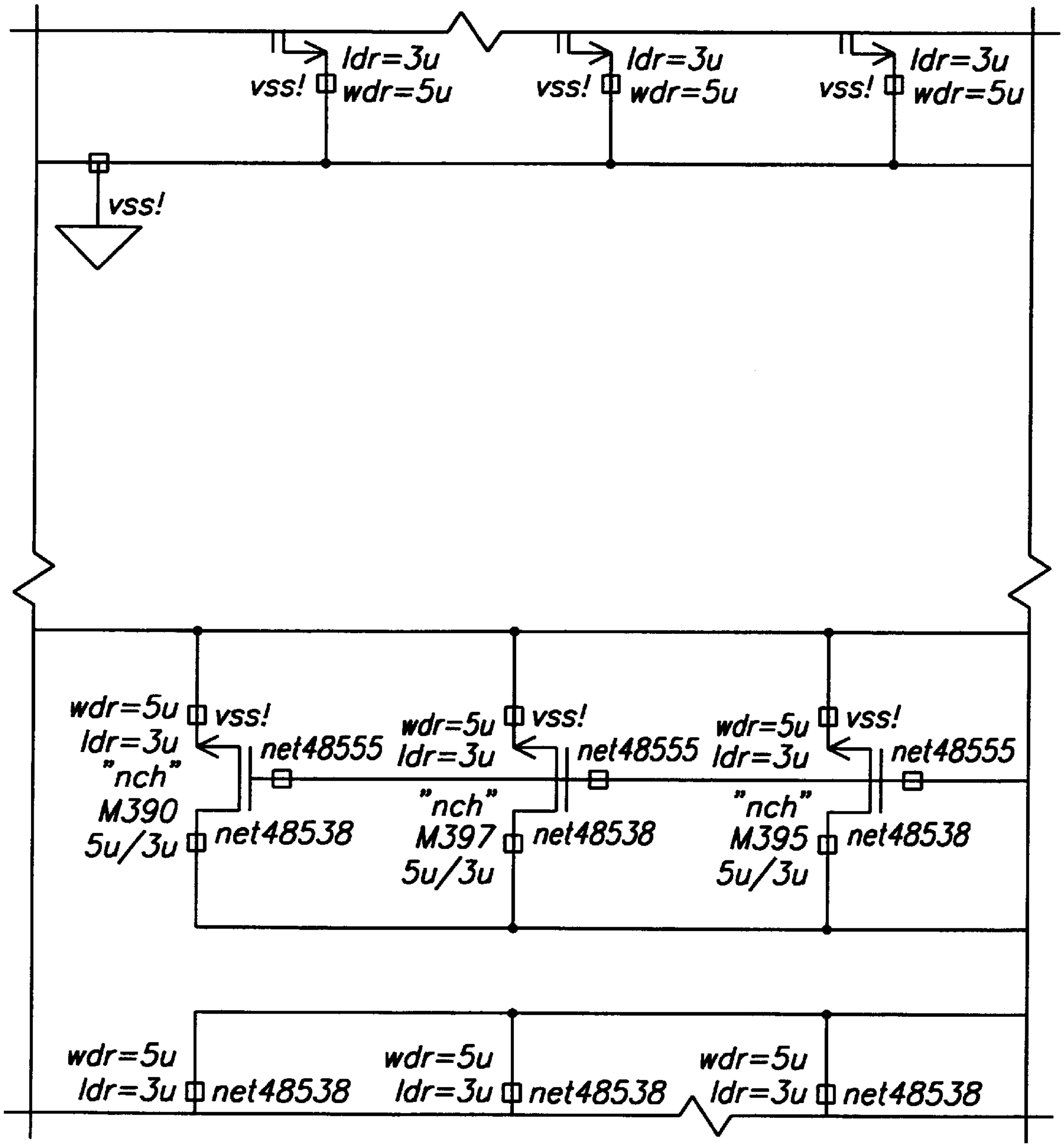
Figure 16C:
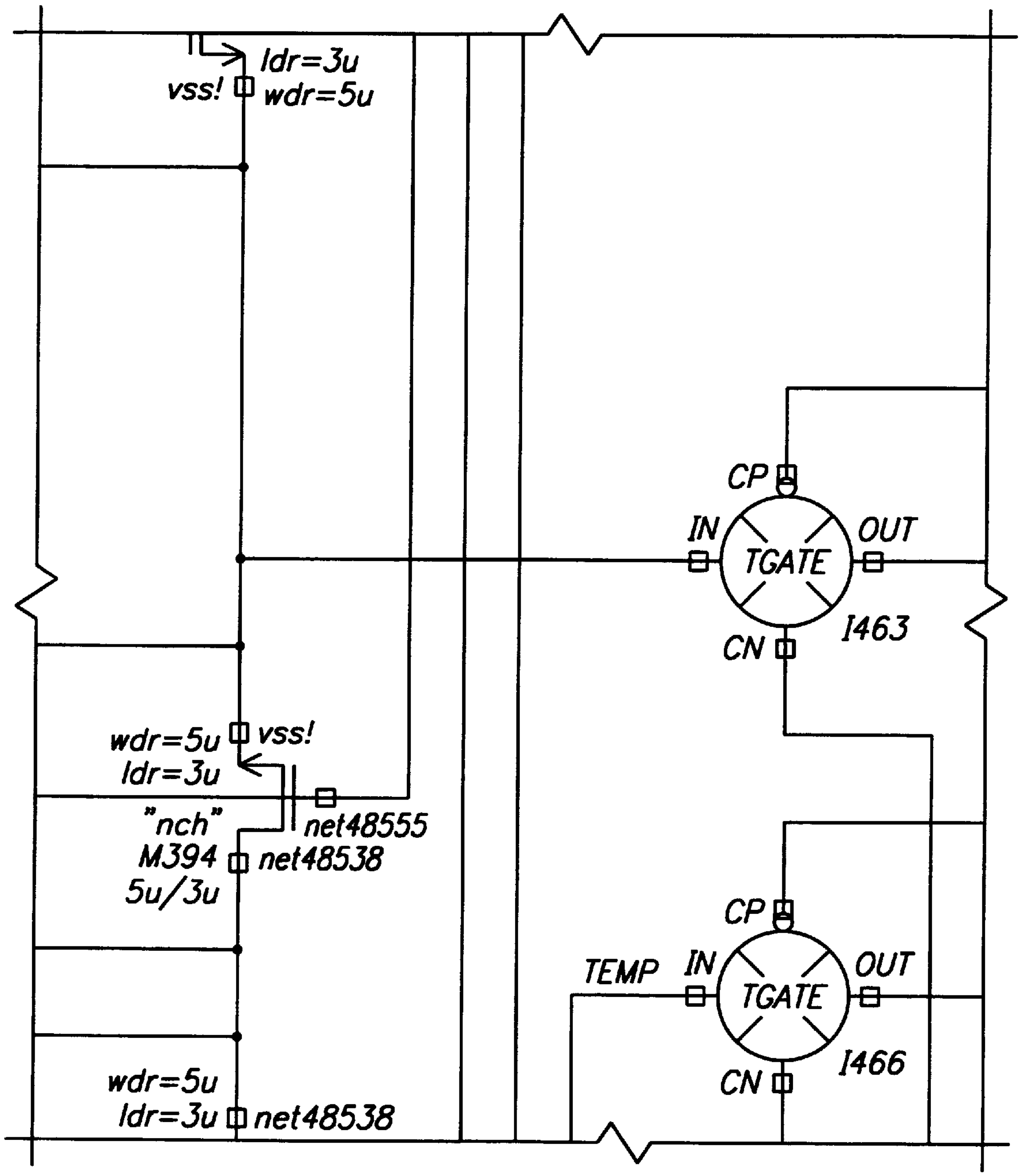
Figure 16C:
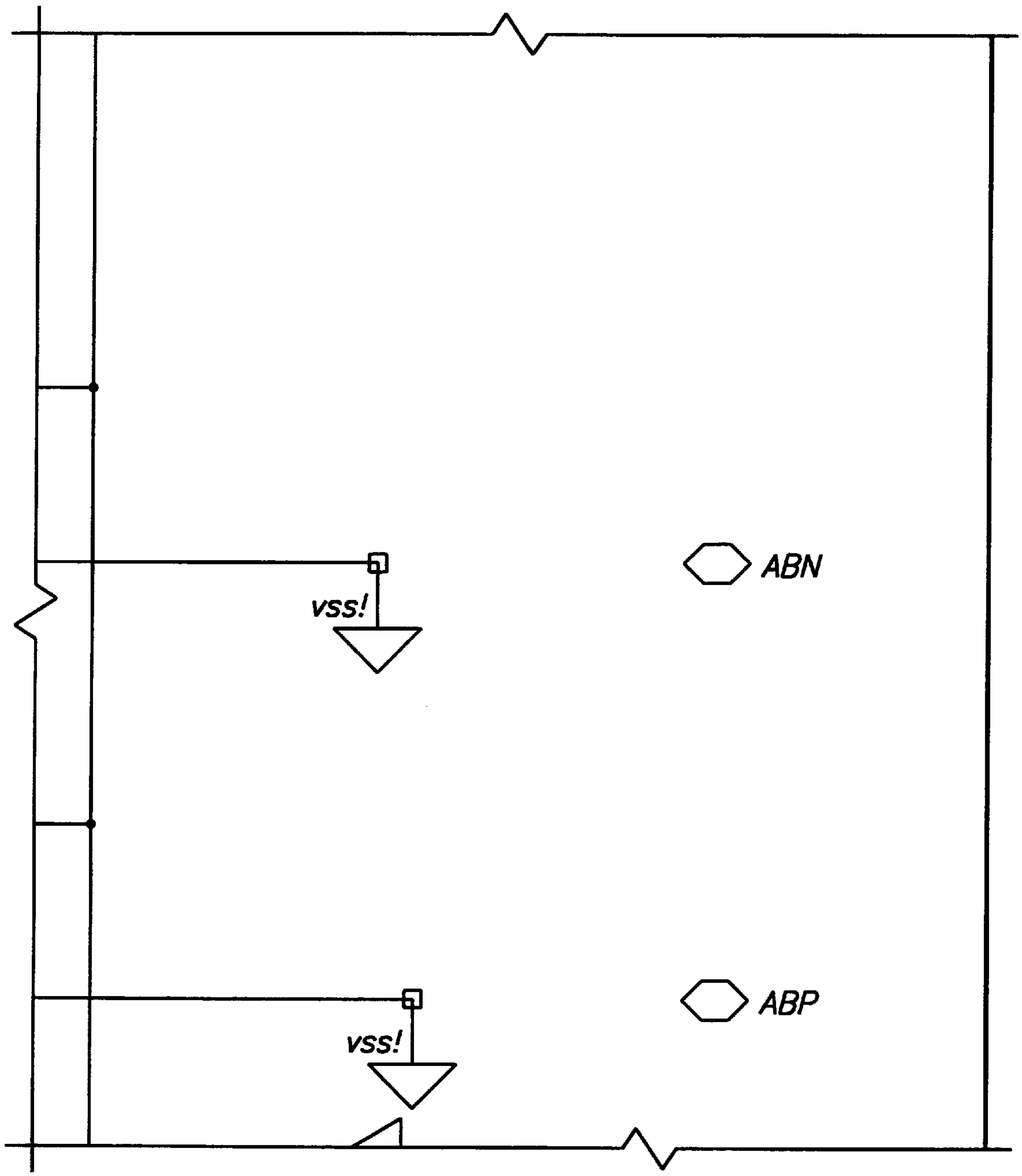
Figure 16D:
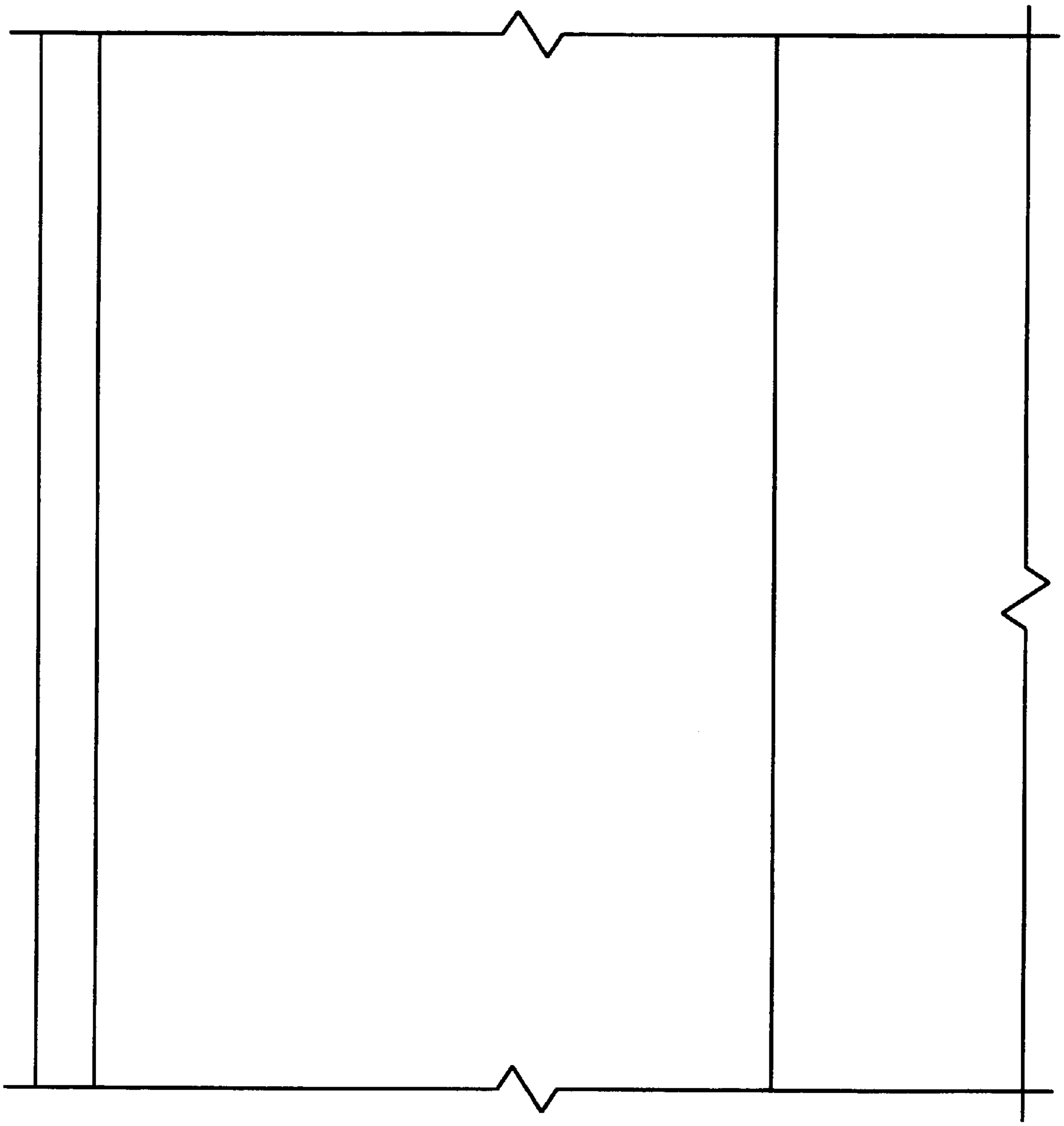
Figure 16D:
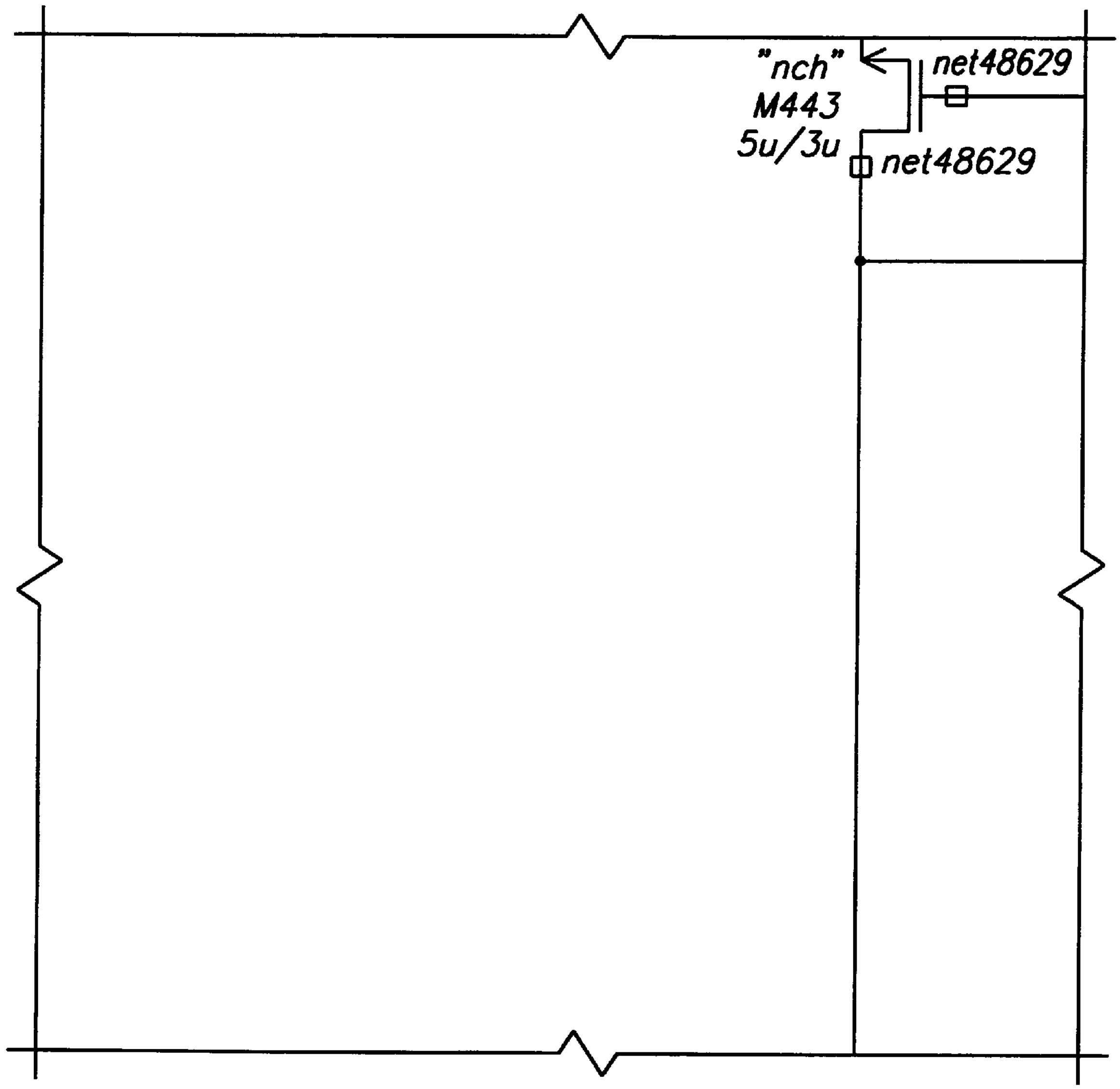
Figure 16D:
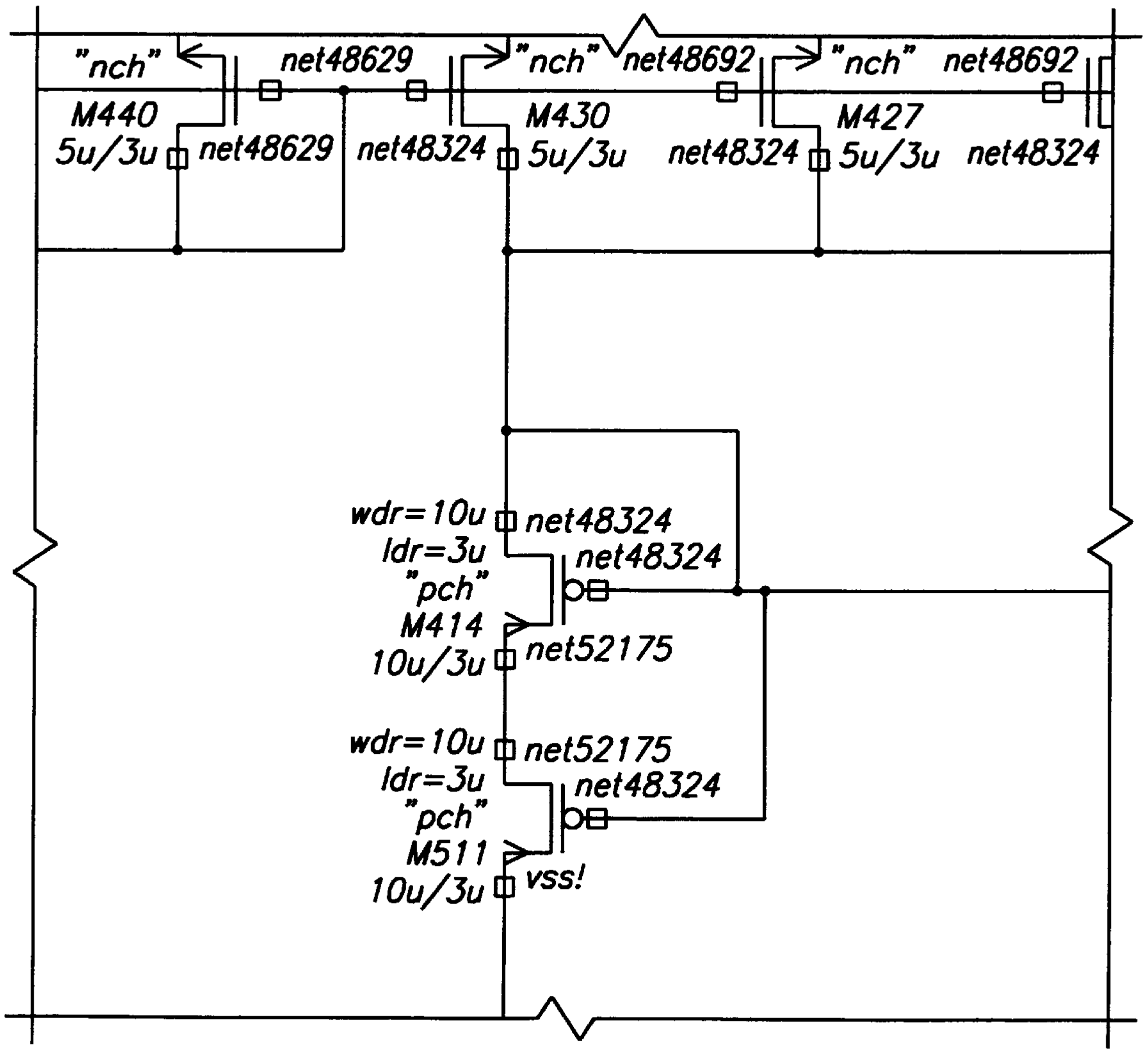
Figure 16D:
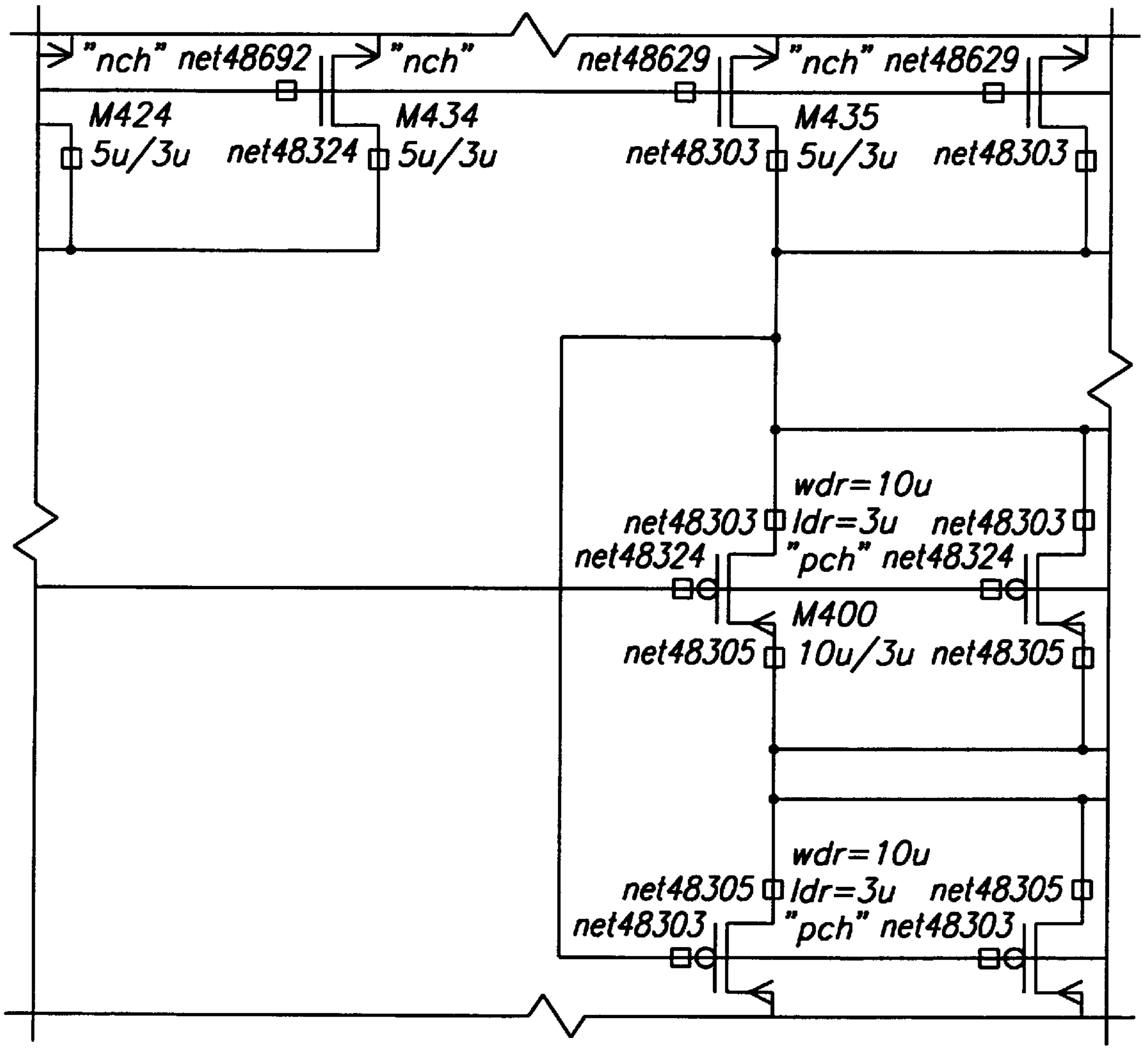
Figure 16D:
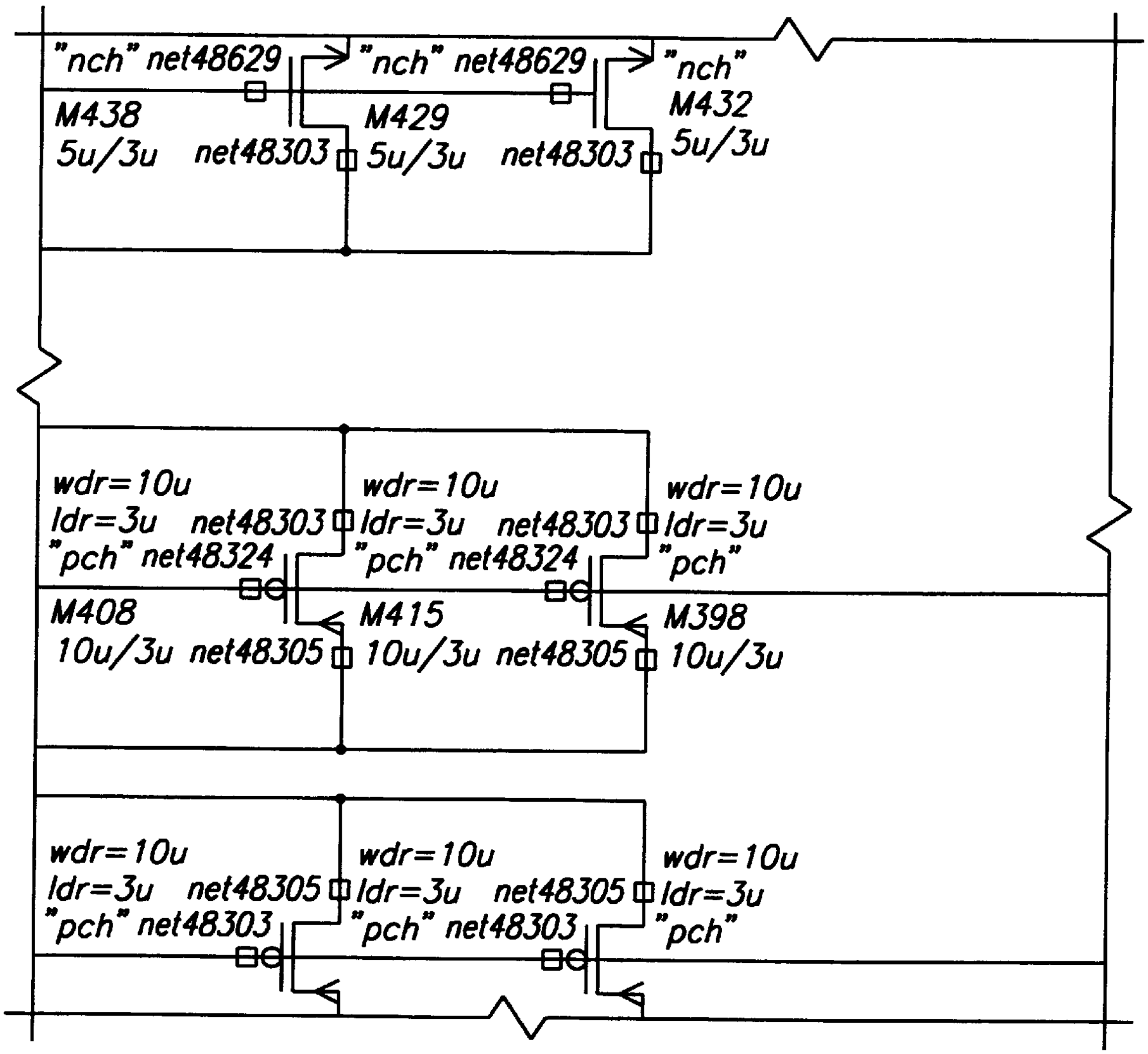
Figure 16D:
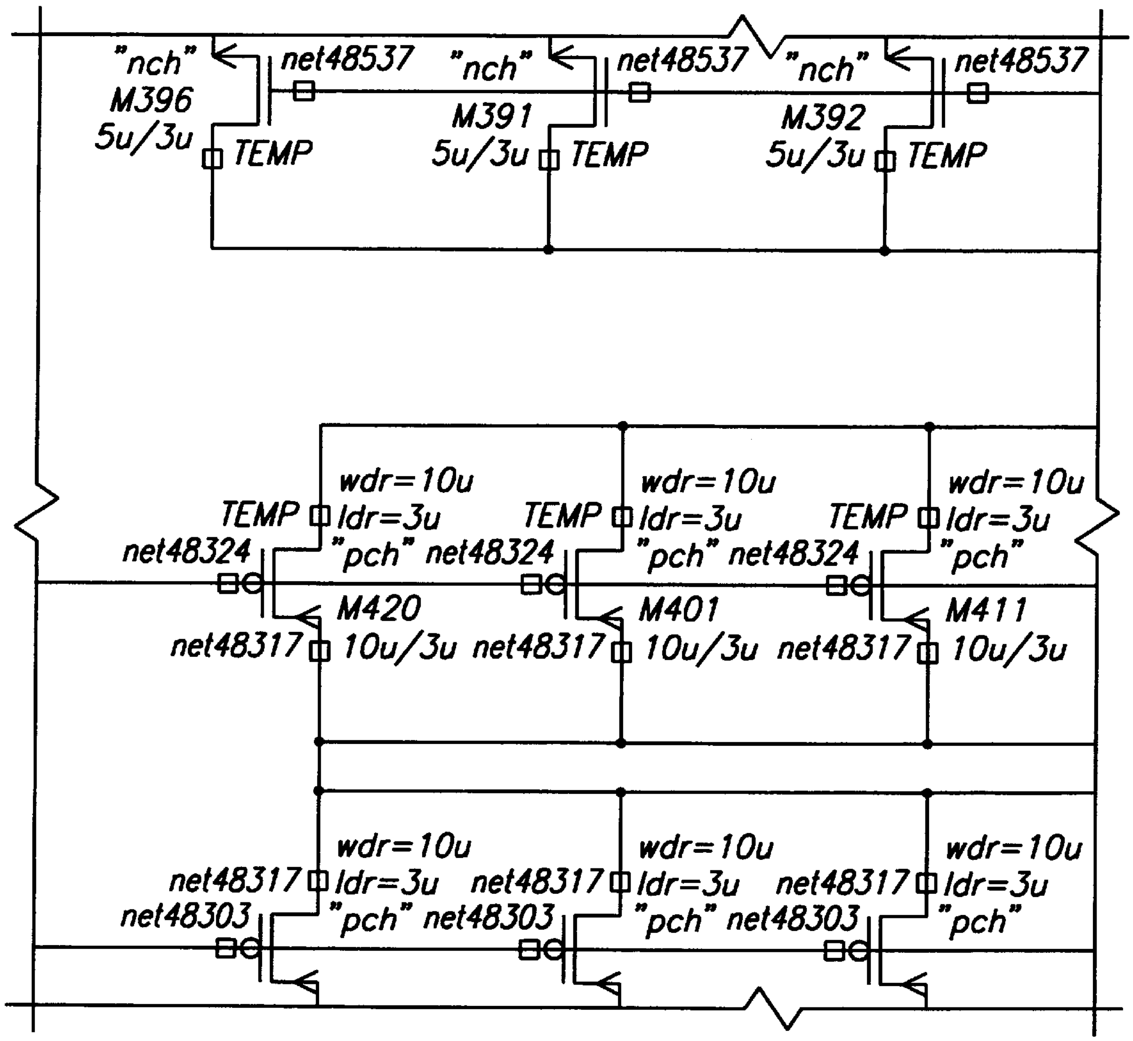
Figure 16D:
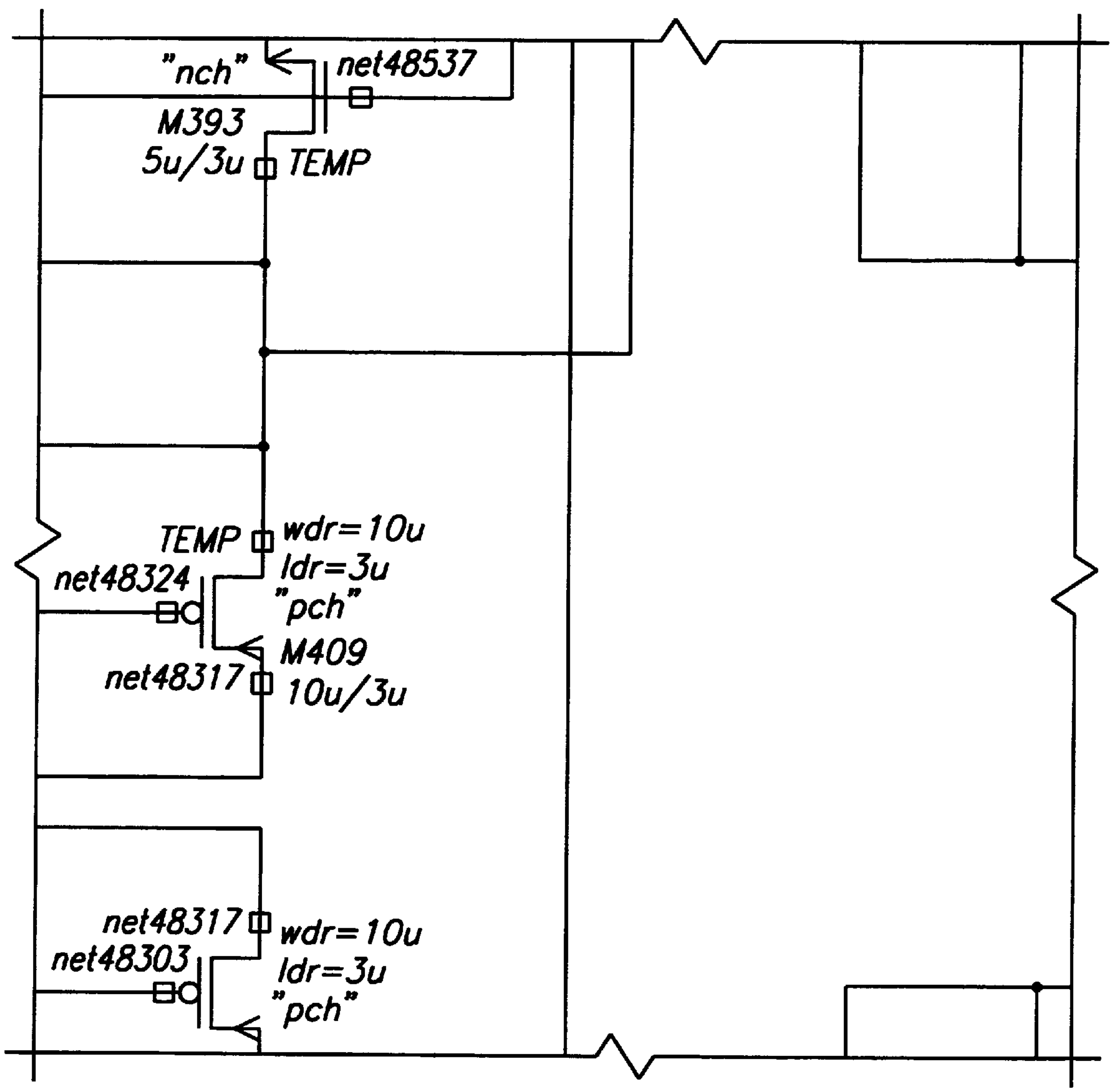
Figure 16D:
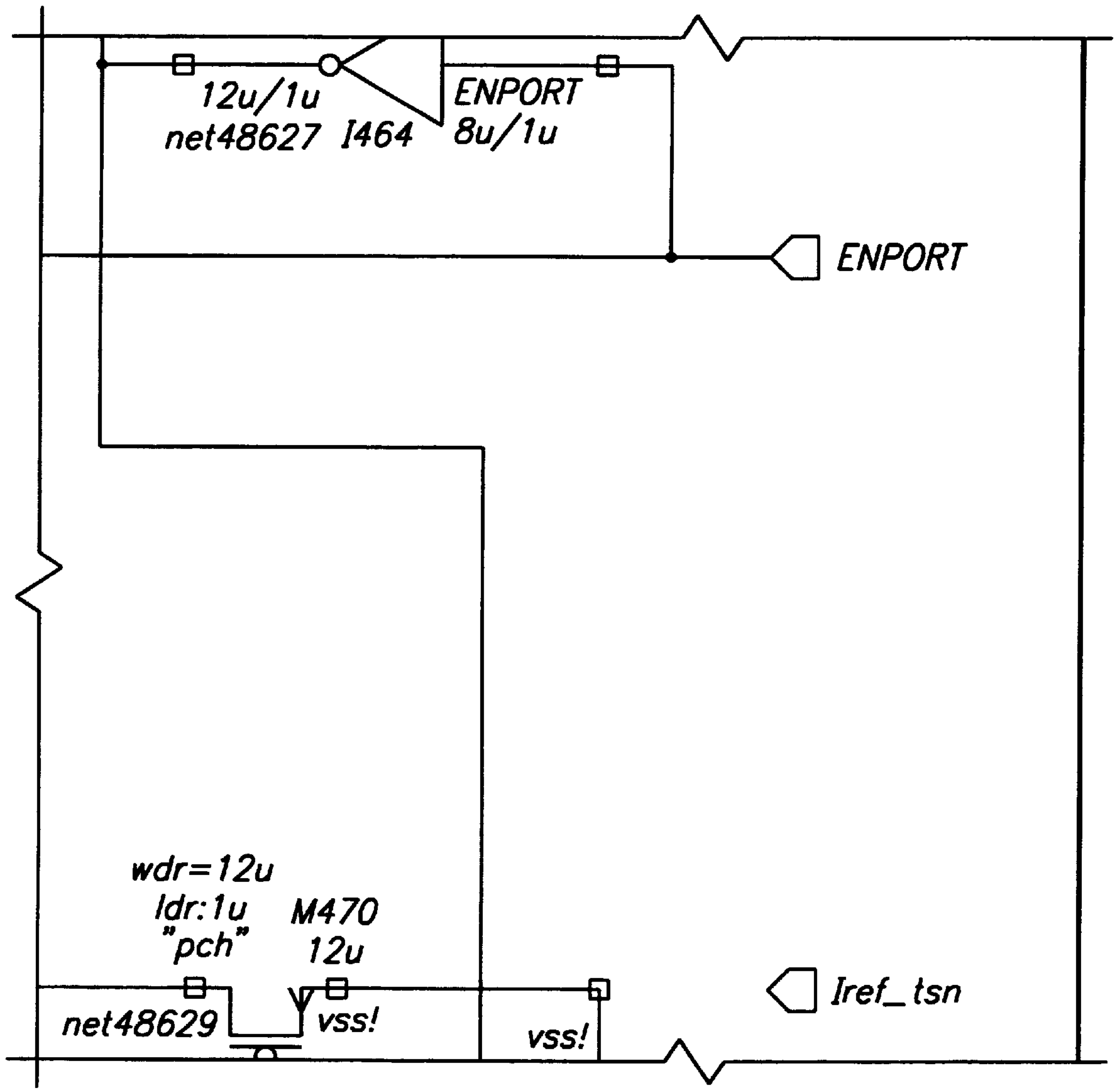
Figure 16E:
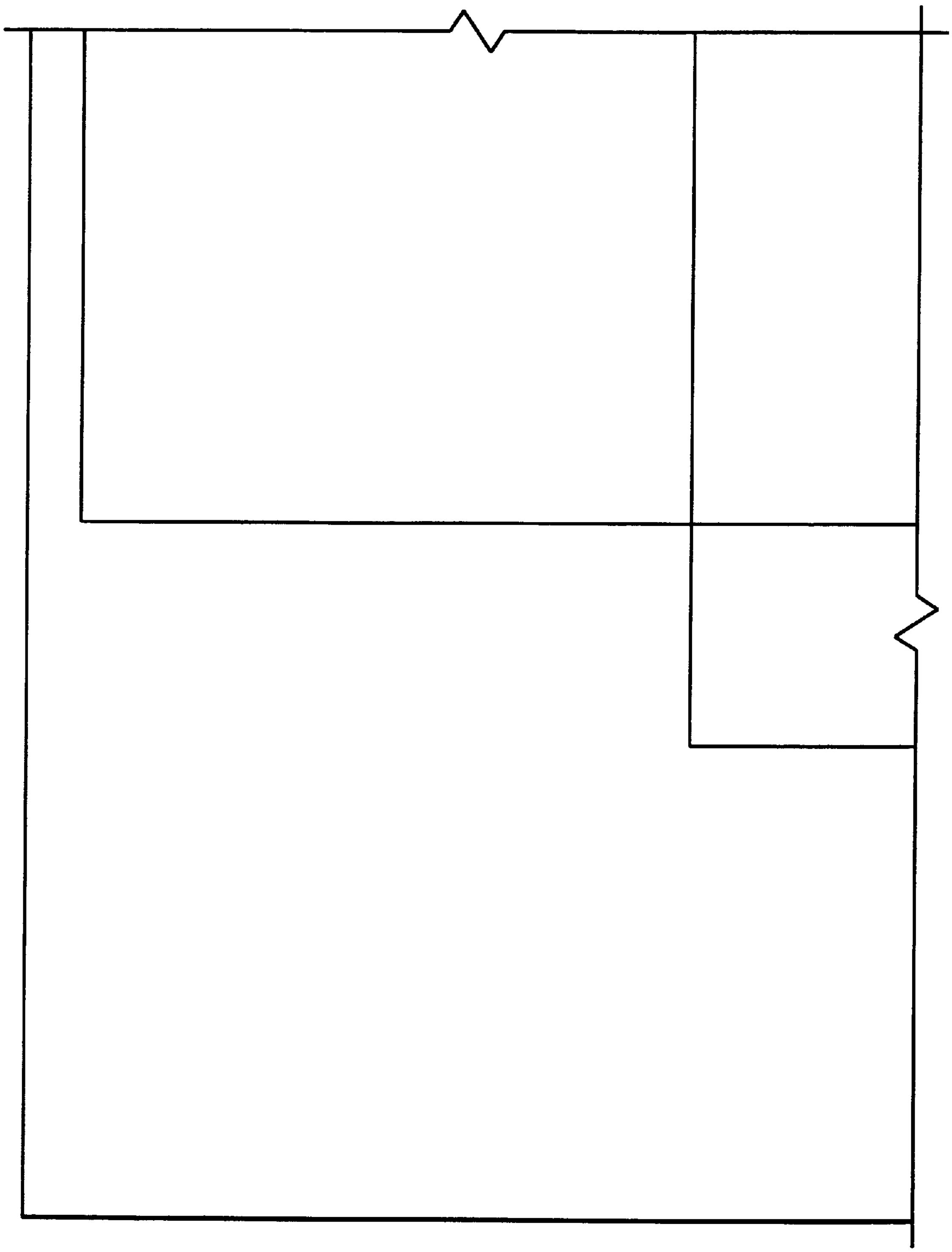
Figure 16E:
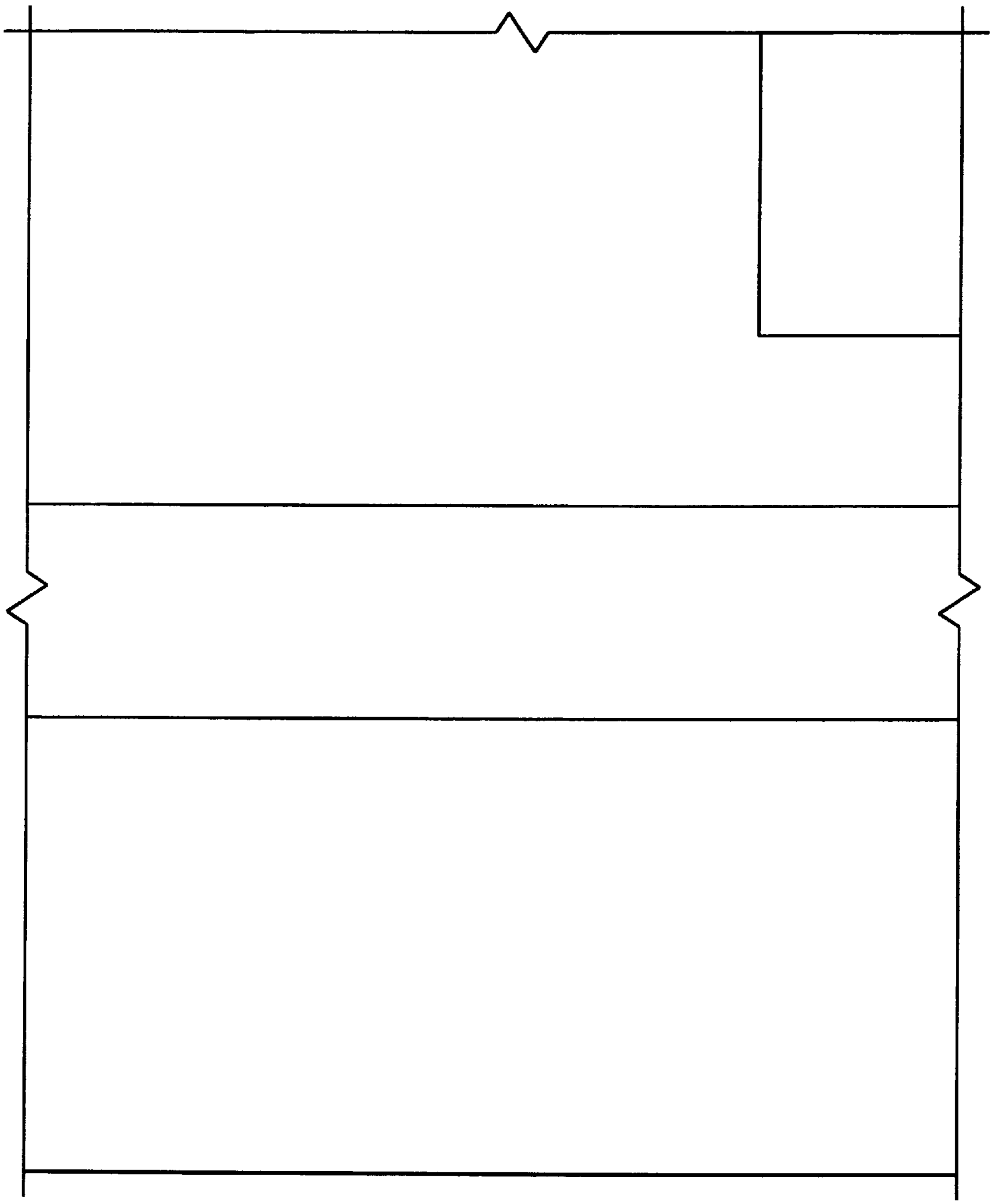
Figure 16E:
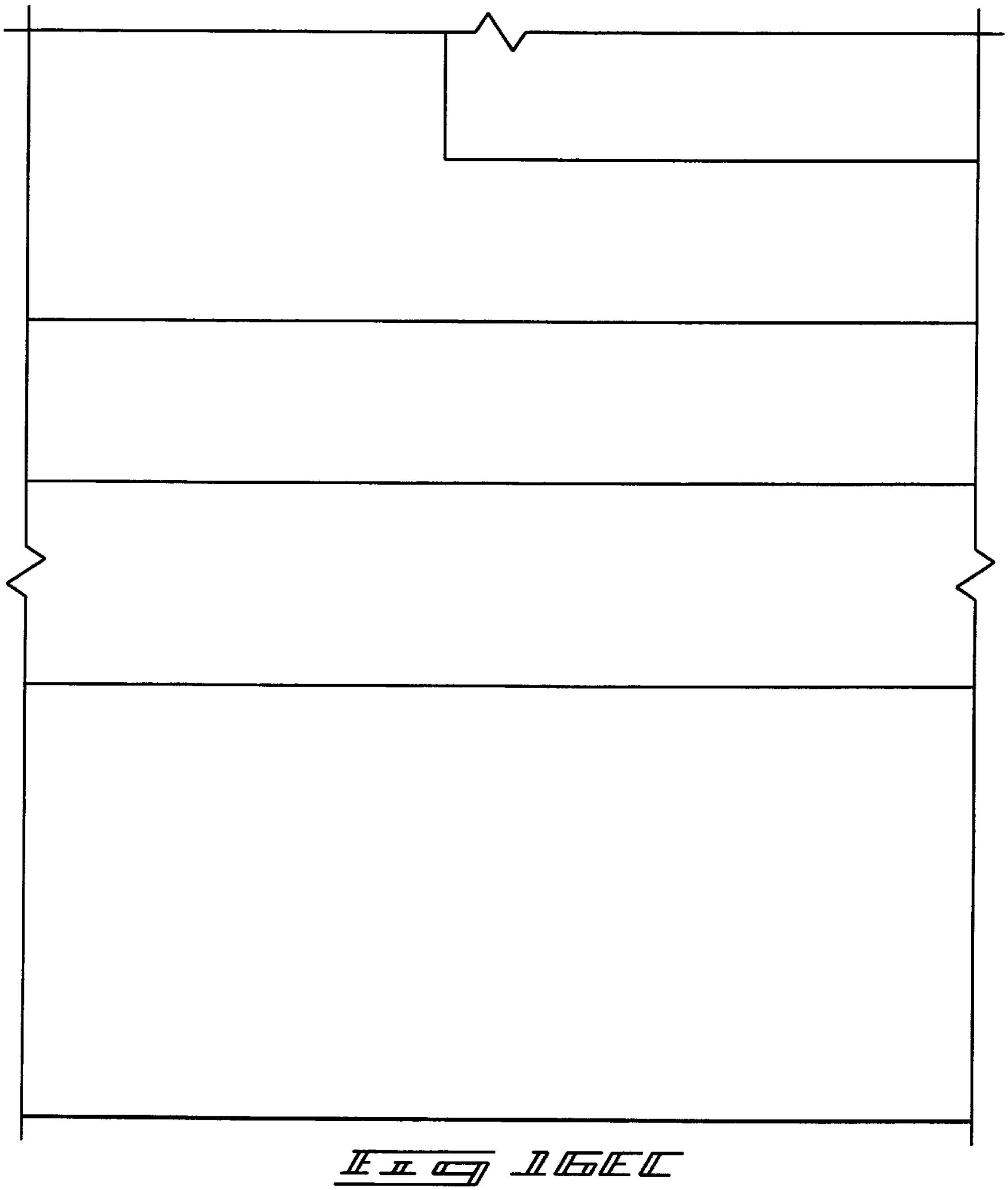
Figure 16E:
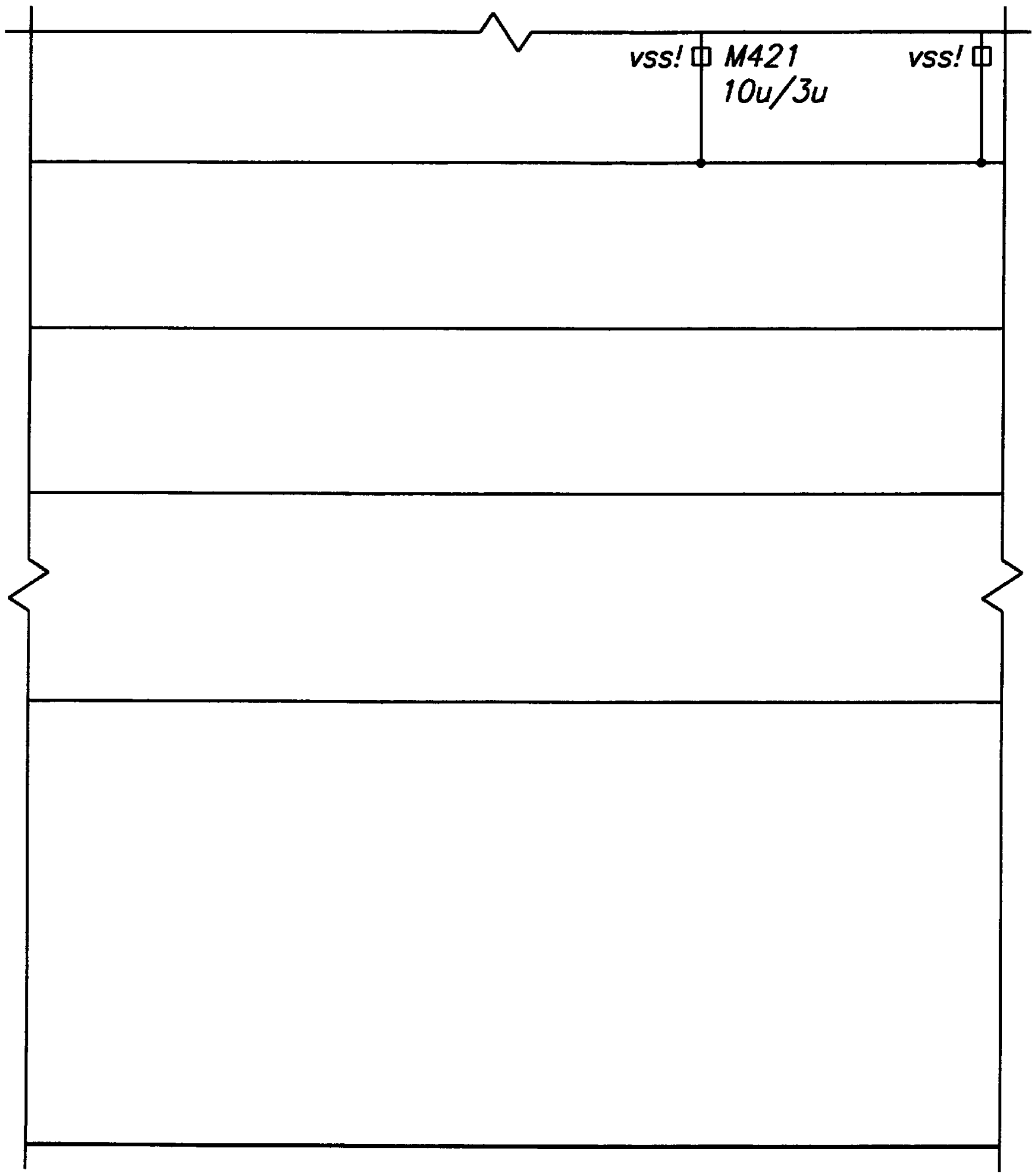
Figure 16E:
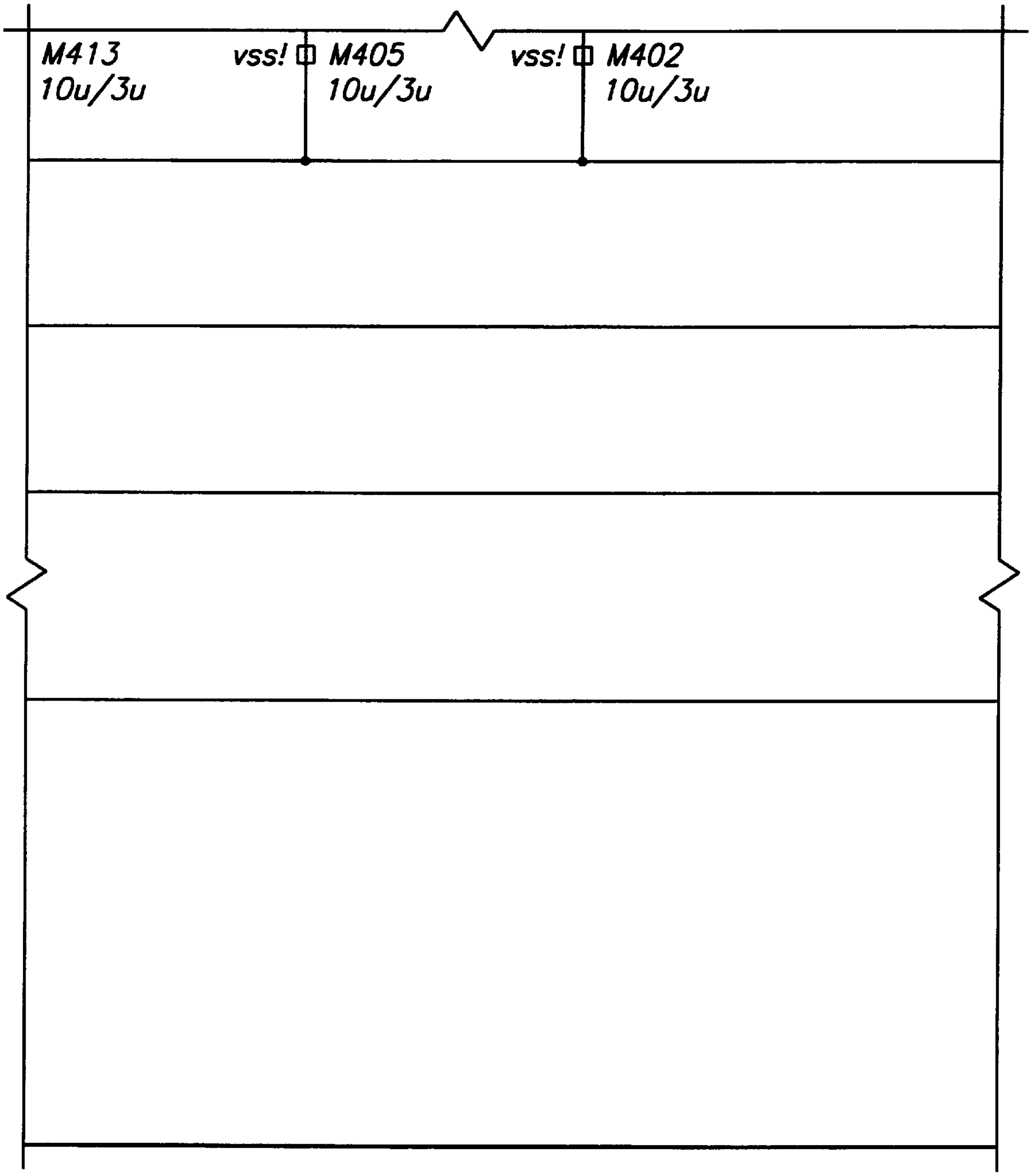
Figure 16E:
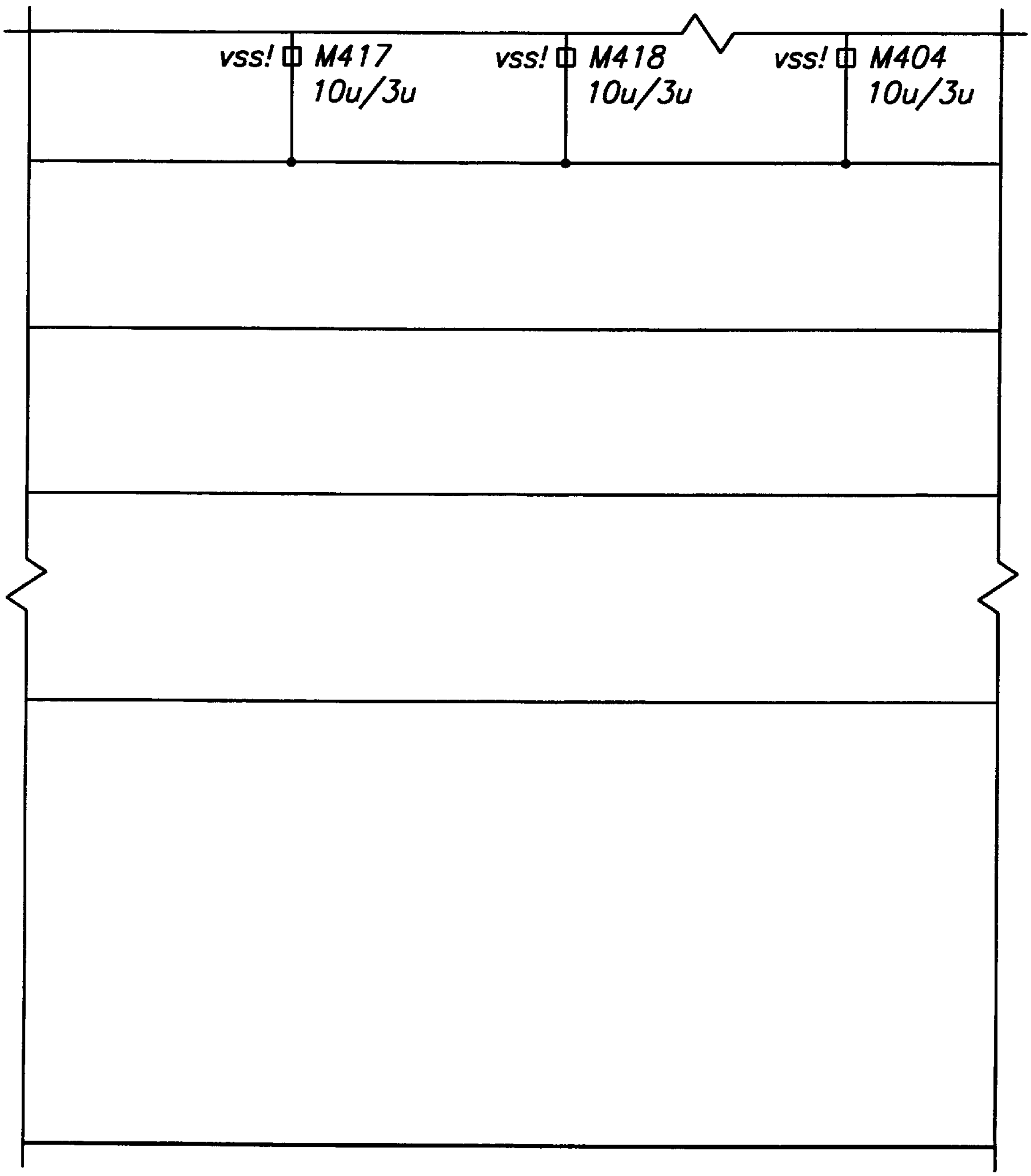
Figure 16E:
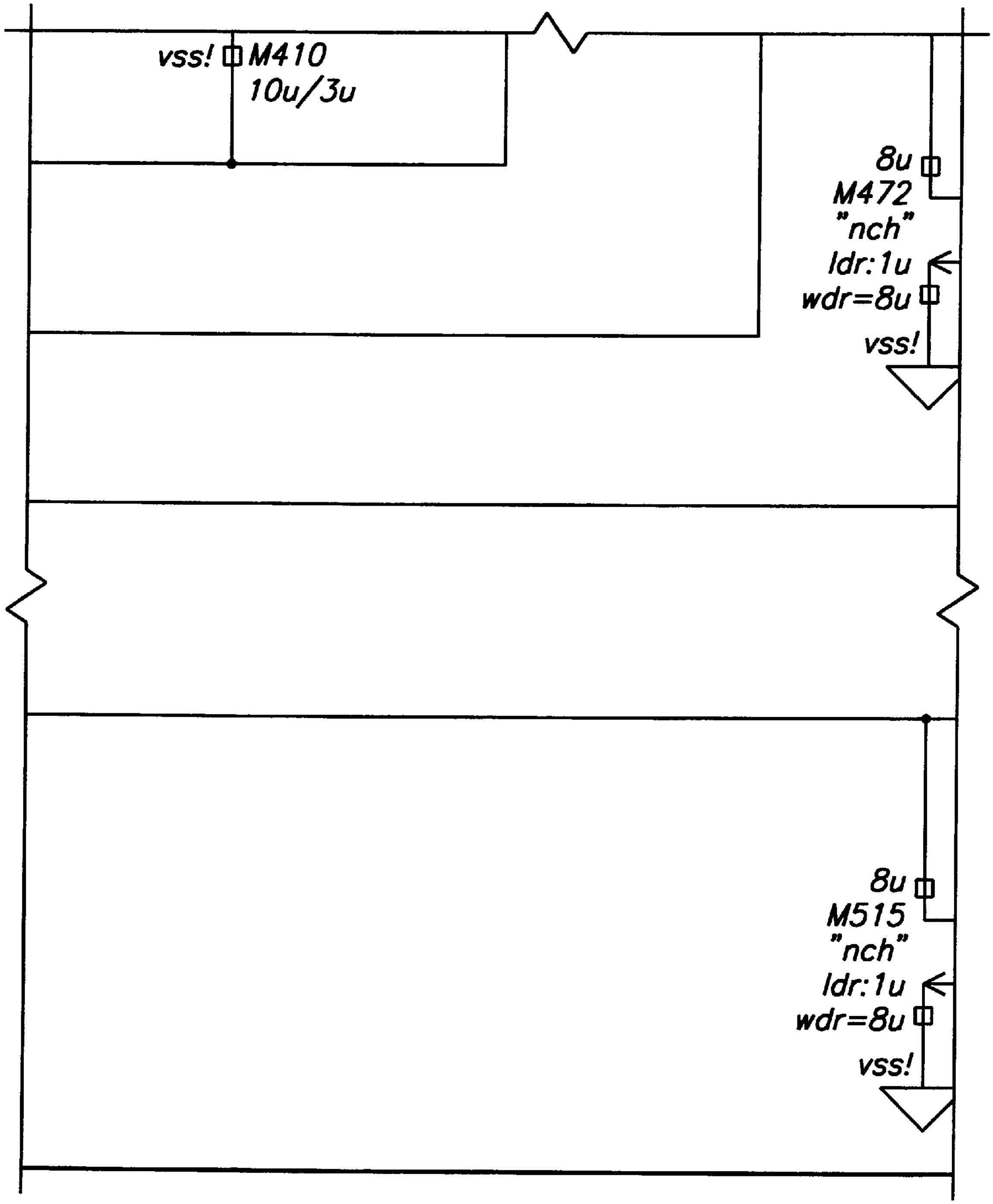
Figure 16E:
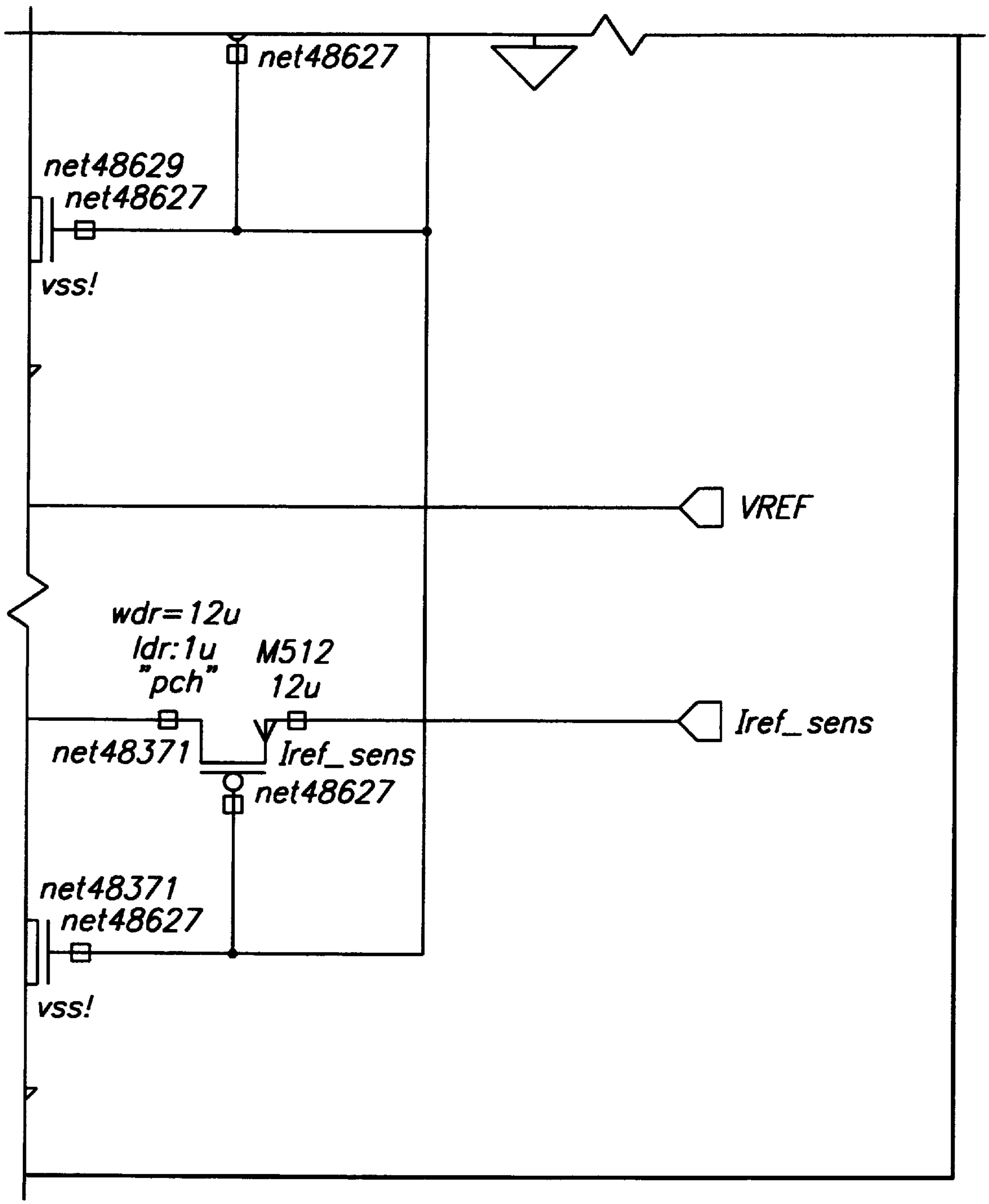

FIG. 16 is a graph illustrating how FIGS. 16AA–EH are to be assembled. After such assembly, FIGS. 16AA–EH provide a circuit drawing of a temperature sensor "tsn" included in the circuit of FIGS. 6AA–EK.

FIG. 16.01 is a graph illustrating how FIGS. 16.01AA–DI are to be assembled. After such assembly, FIGS. 16.01AA–DI provide a circuit drawing of an operational amplifier "opamp" included in the circuit of FIGS. 16AA–EH.

Figure 17:
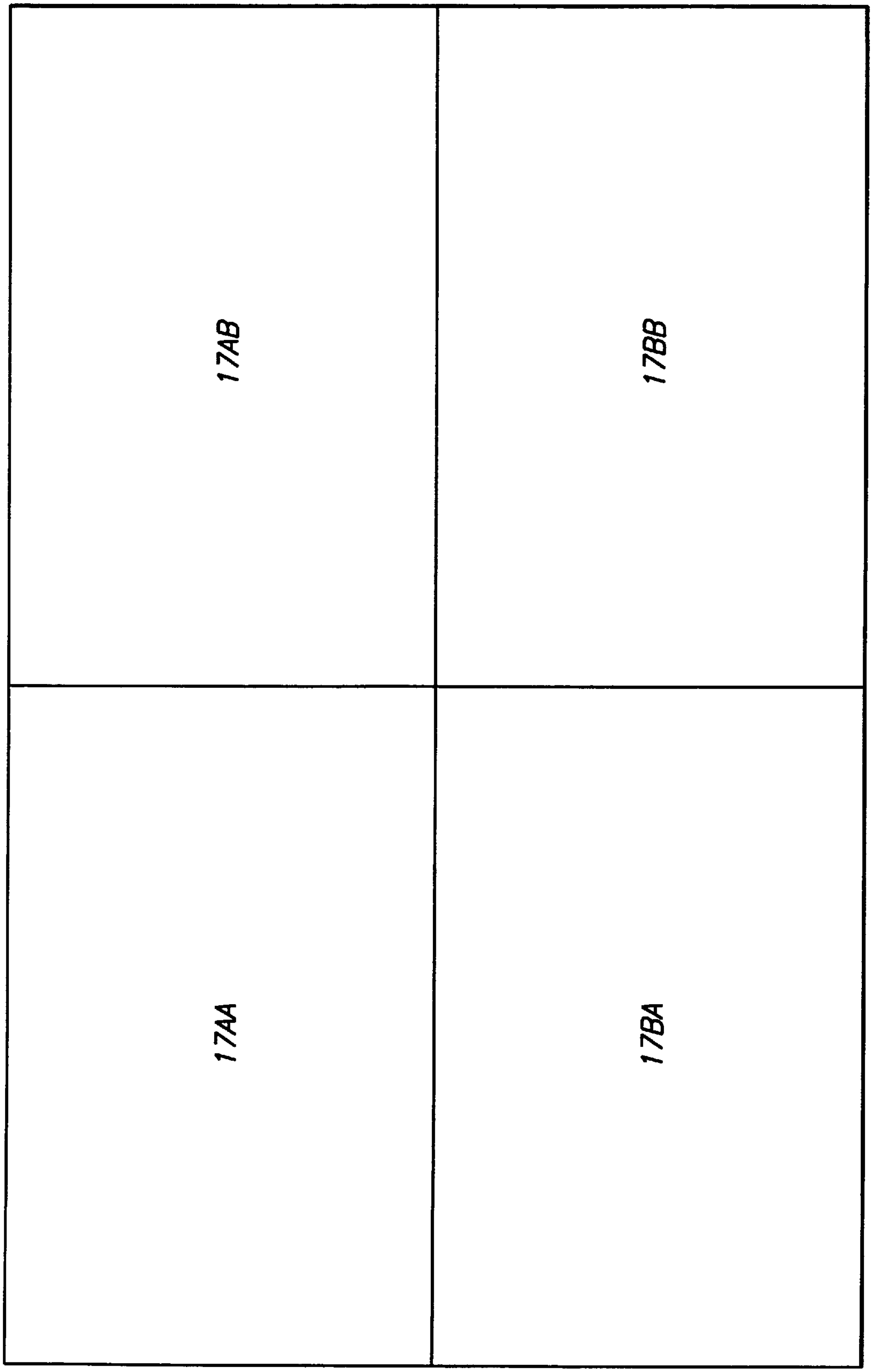
Figure 11A:
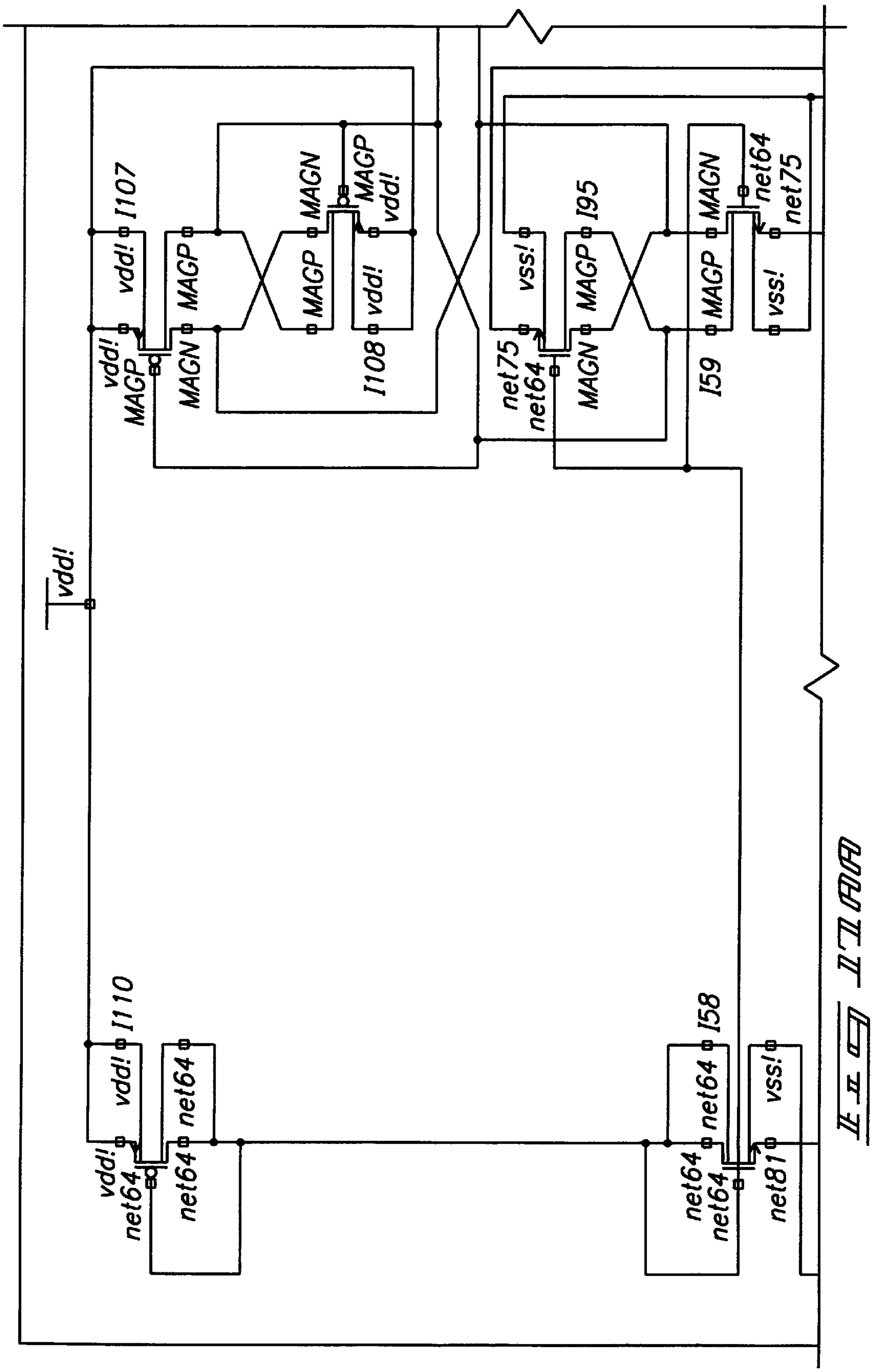
Figure 117A:
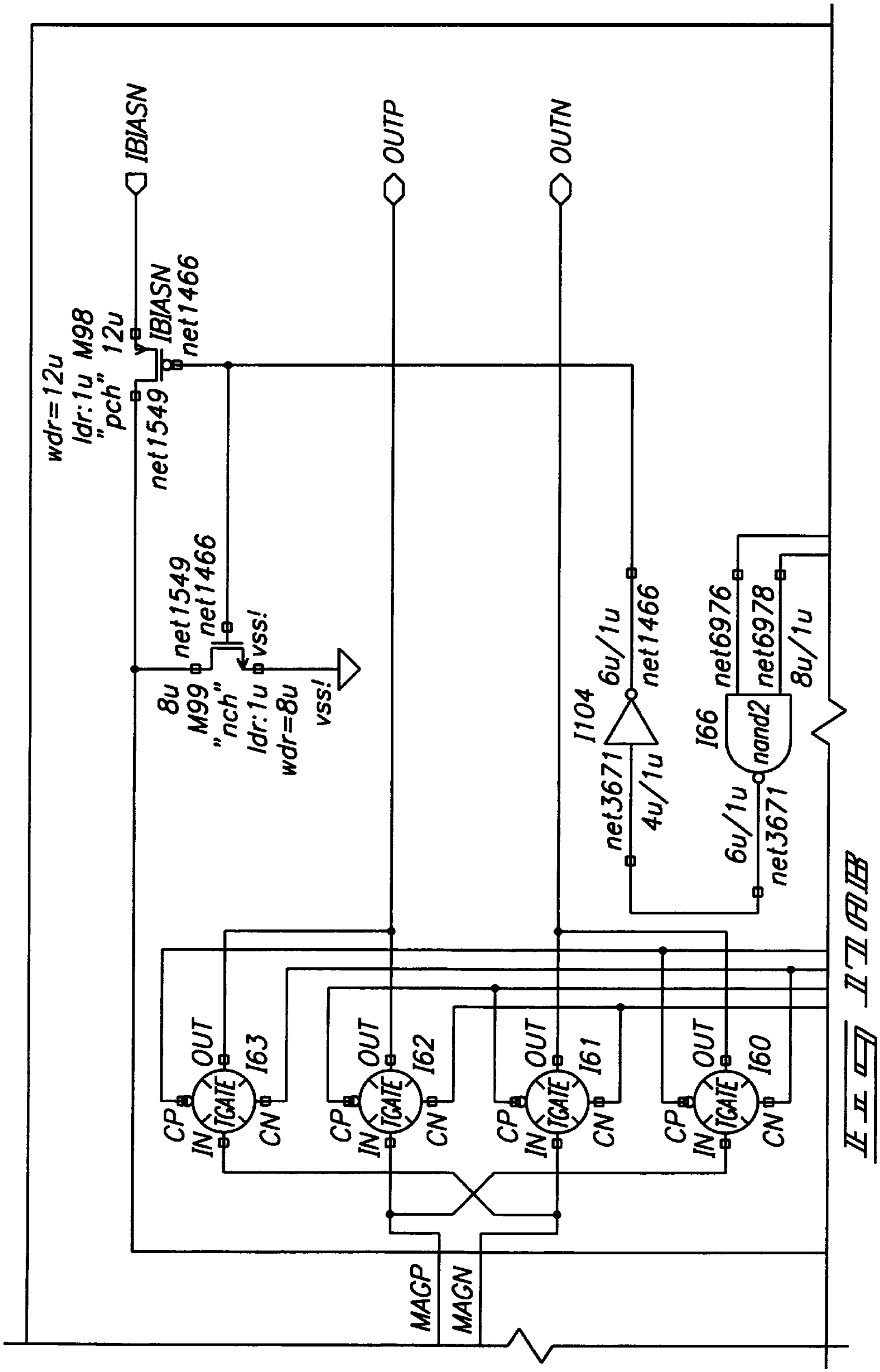
Figure 11B:
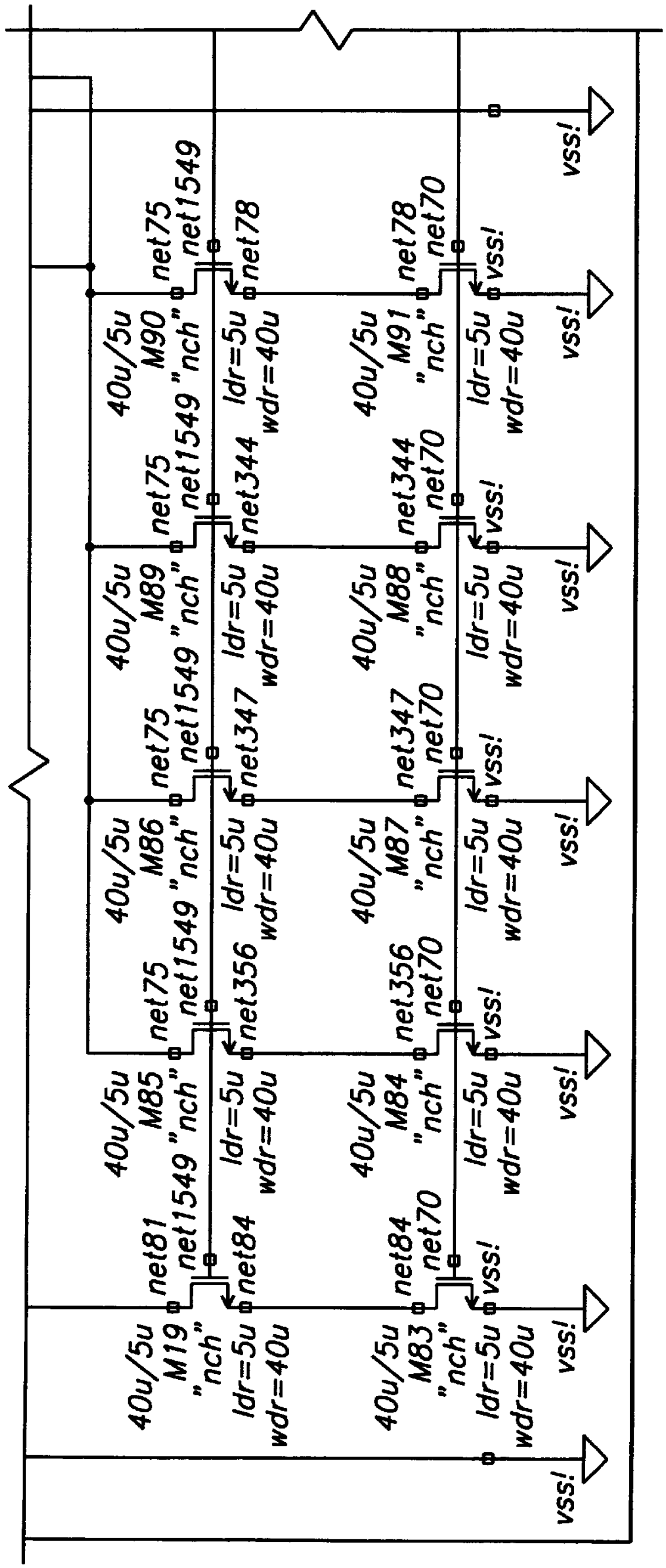
Figure 12B:
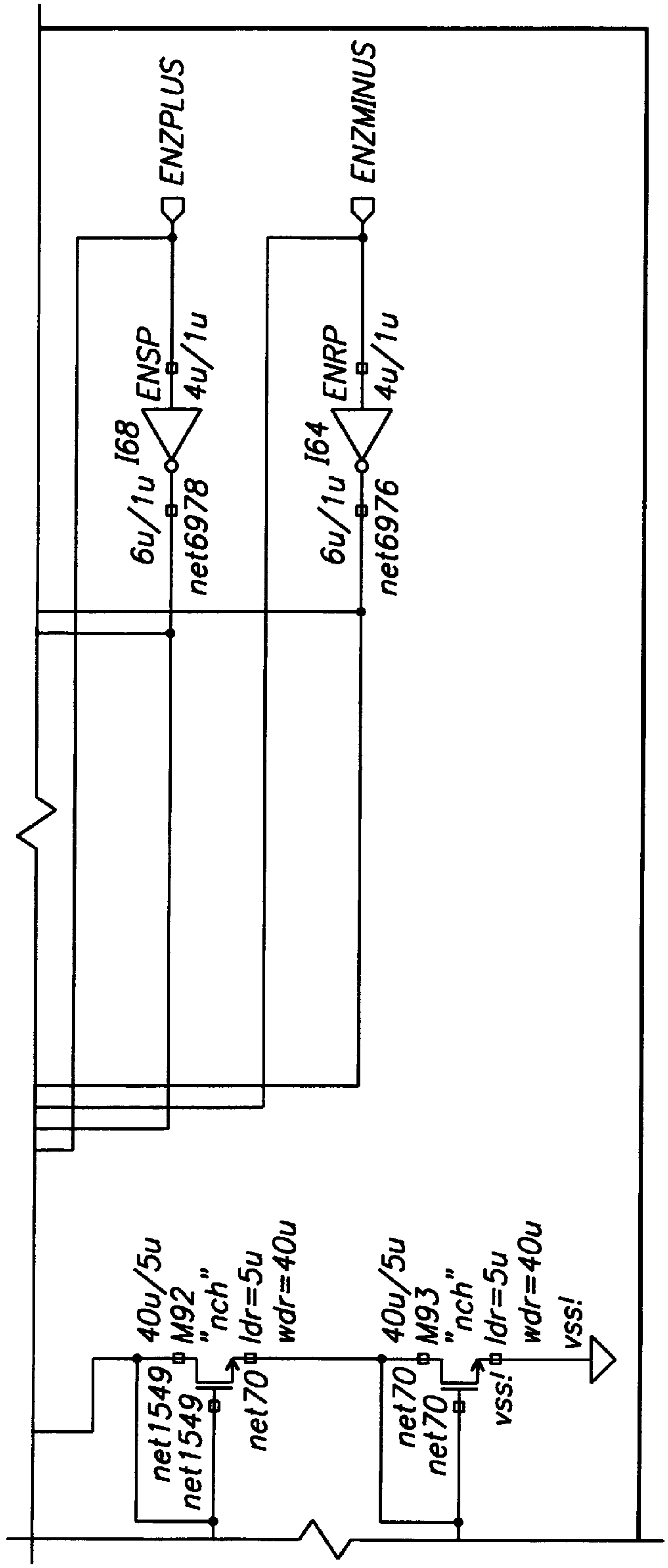

FIG. 17 is a graph illustrating how FIGS. 17AA–BB are to be assembled. After such assembly, FIGS. 17AA–BB provide a circuit drawing of a magnetic field sensor "mag" (a sensor for sensing magnetic fields) included in the circuit of FIGS. 6AA–EK.

Figure 18:
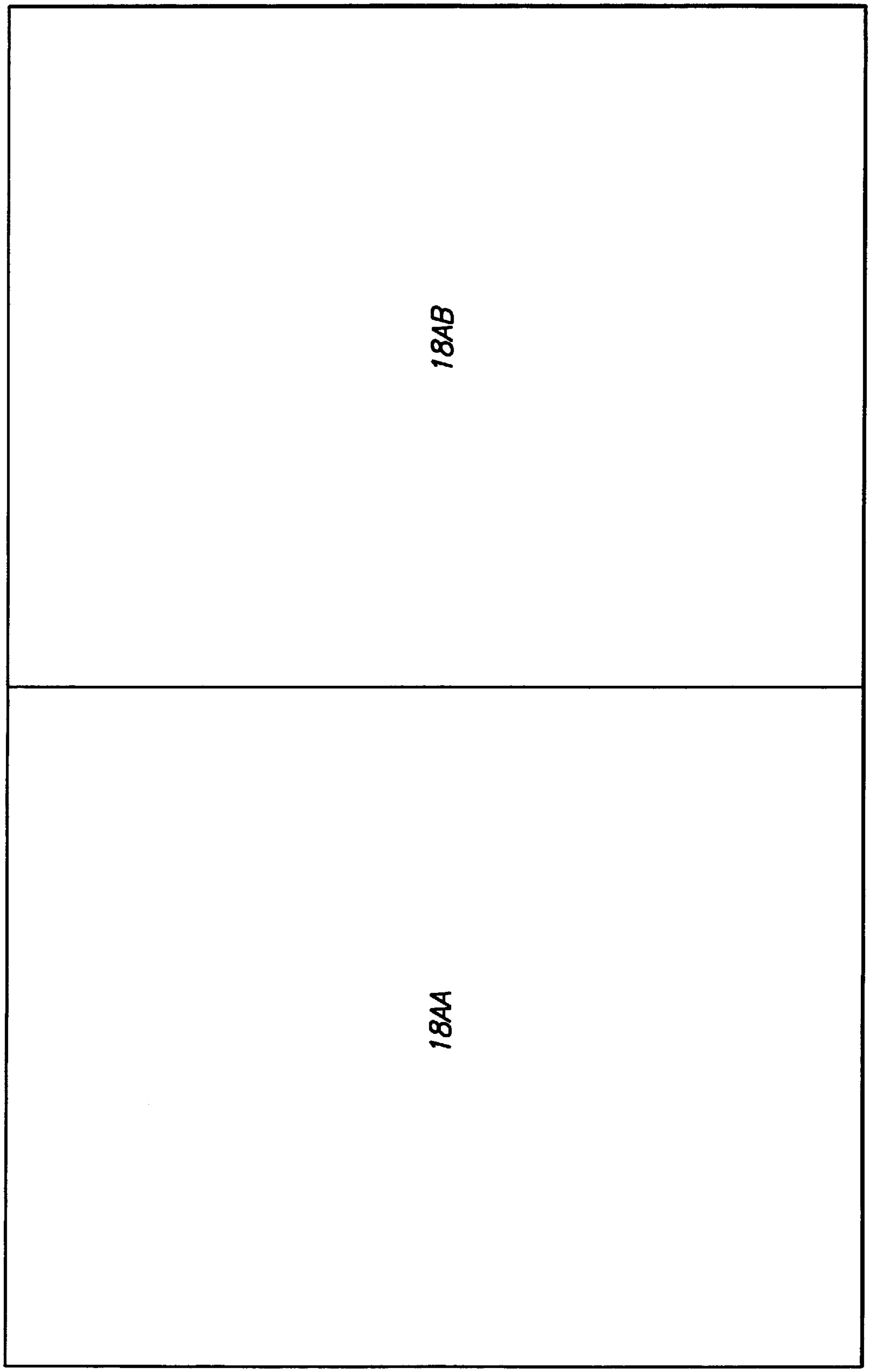
Figure 188A:
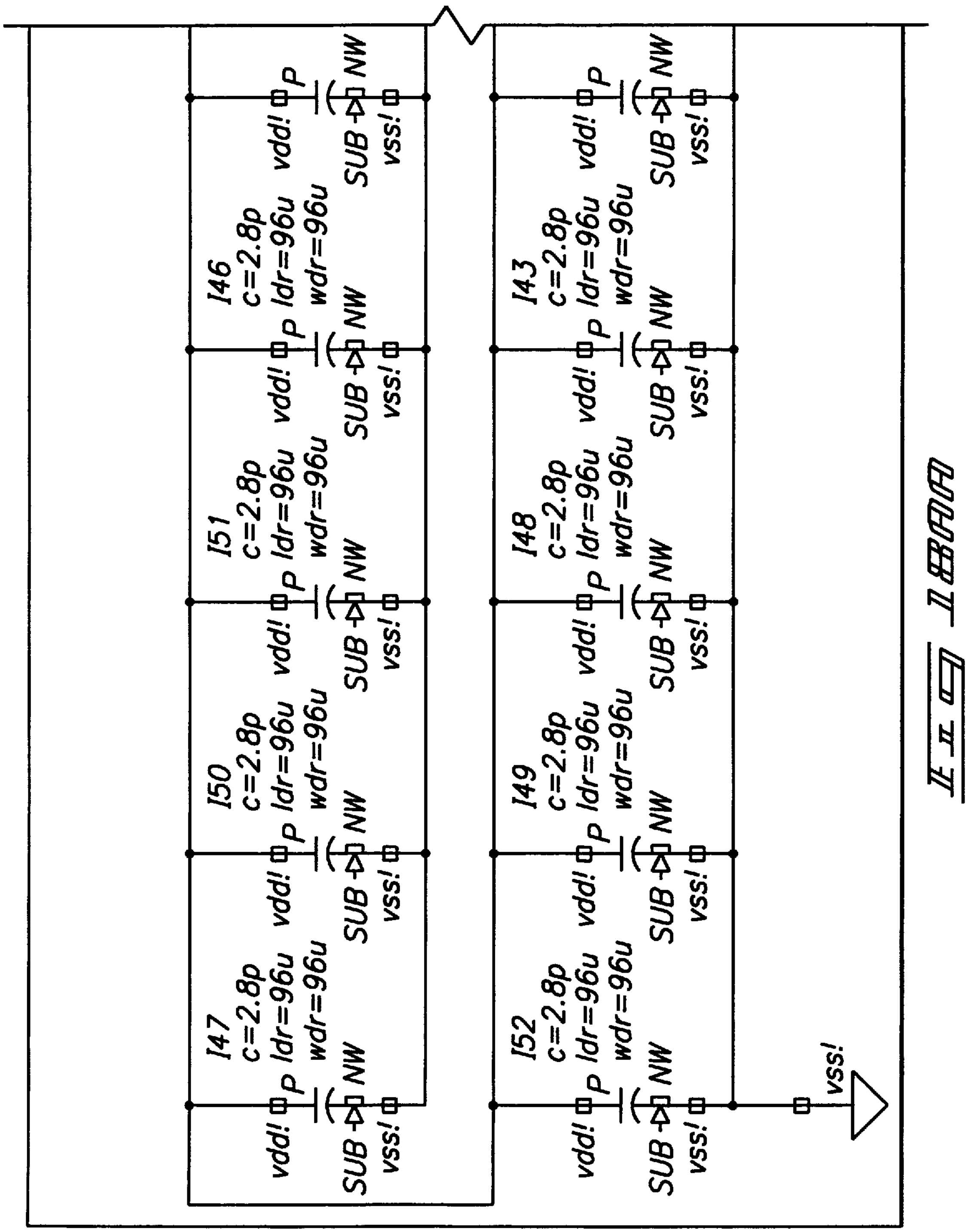
Figure 18A:
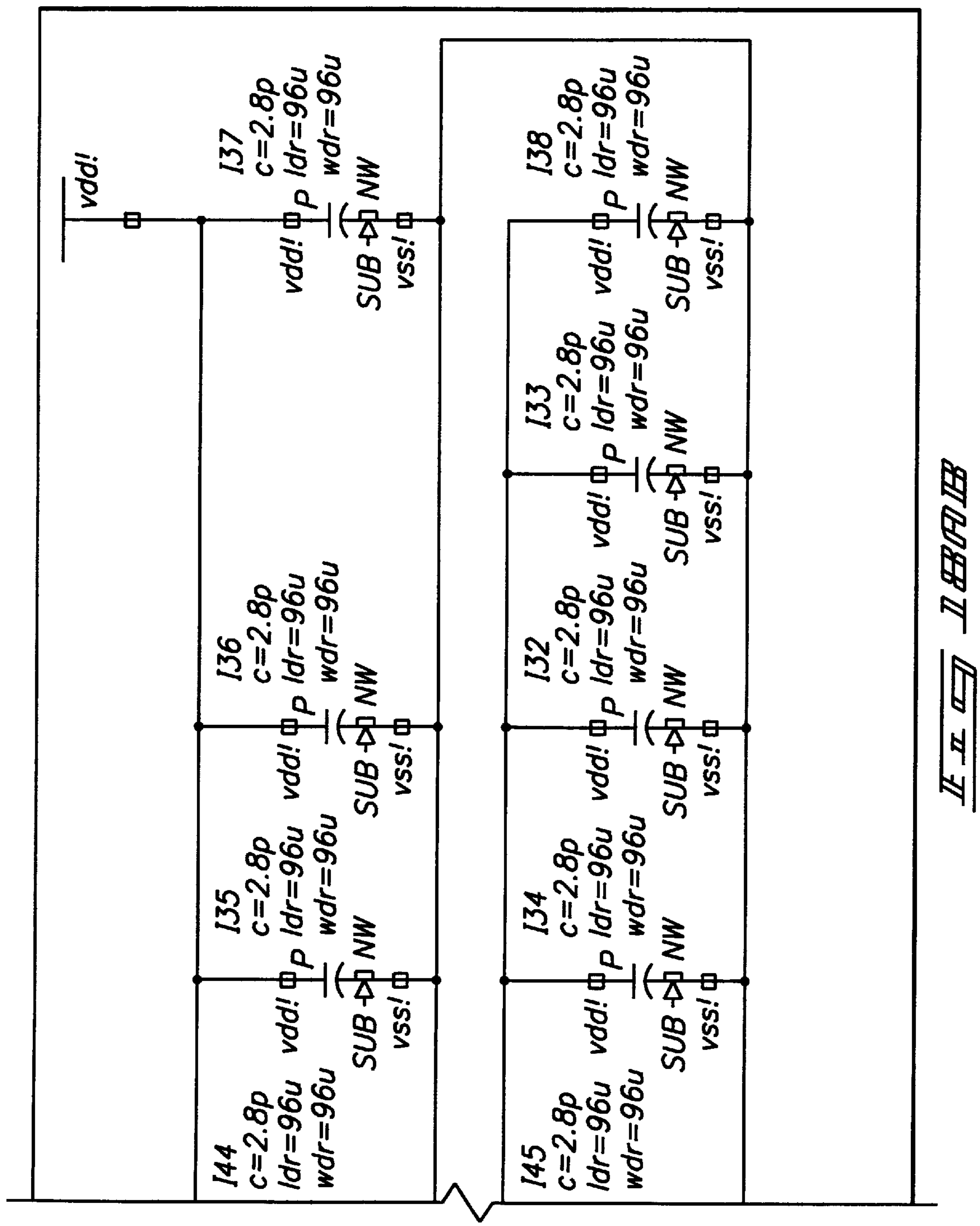

FIG. 18 is a graph illustrating how FIGS. 18AA–AB are to be assembled. After such assembly, FIGS. 18AA–AB provide a circuit drawing of a chip bypass capacitor "bypcap3" included in the circuit of FIGS. 6AA–EK.

Figure 19A:
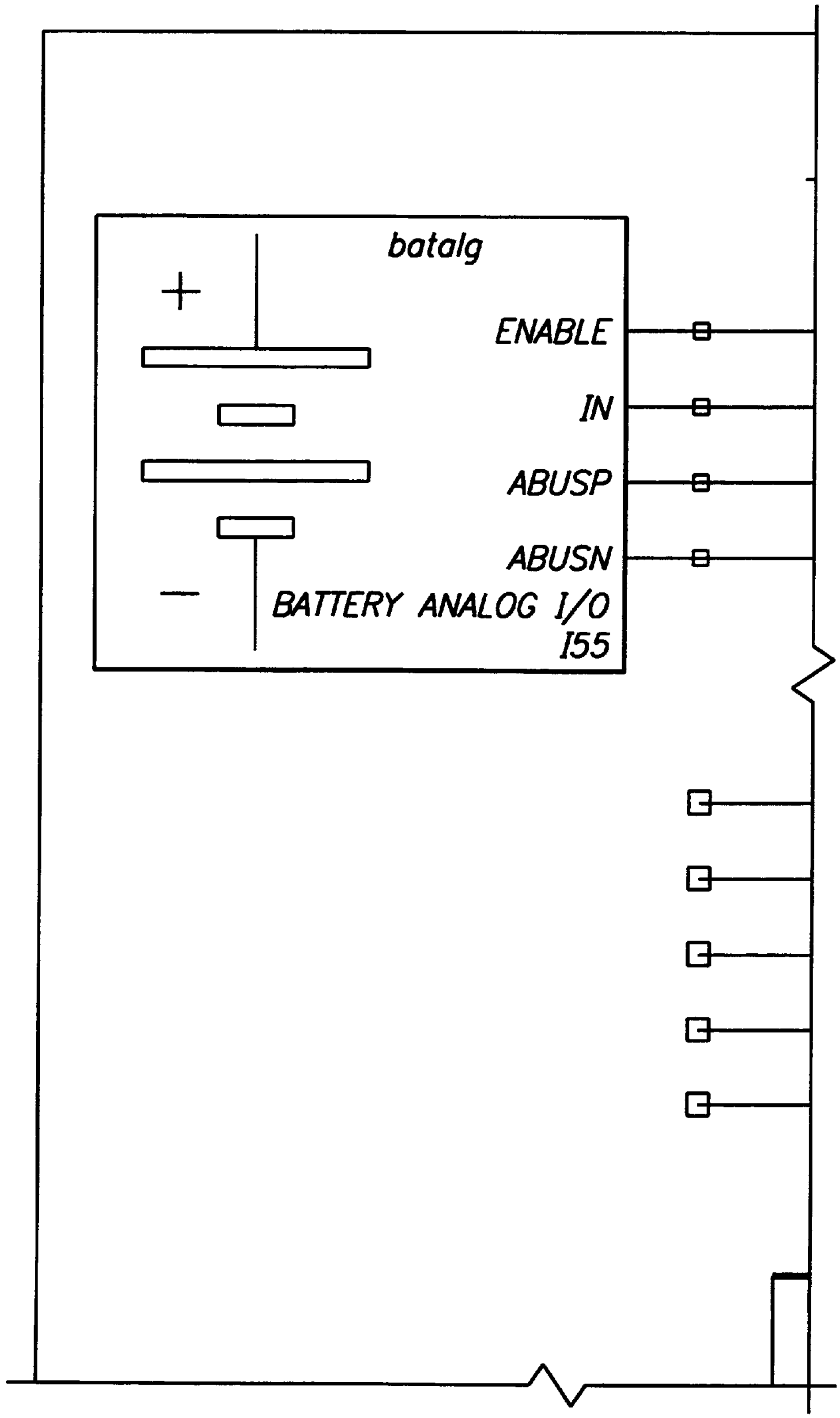
Figure 19A:
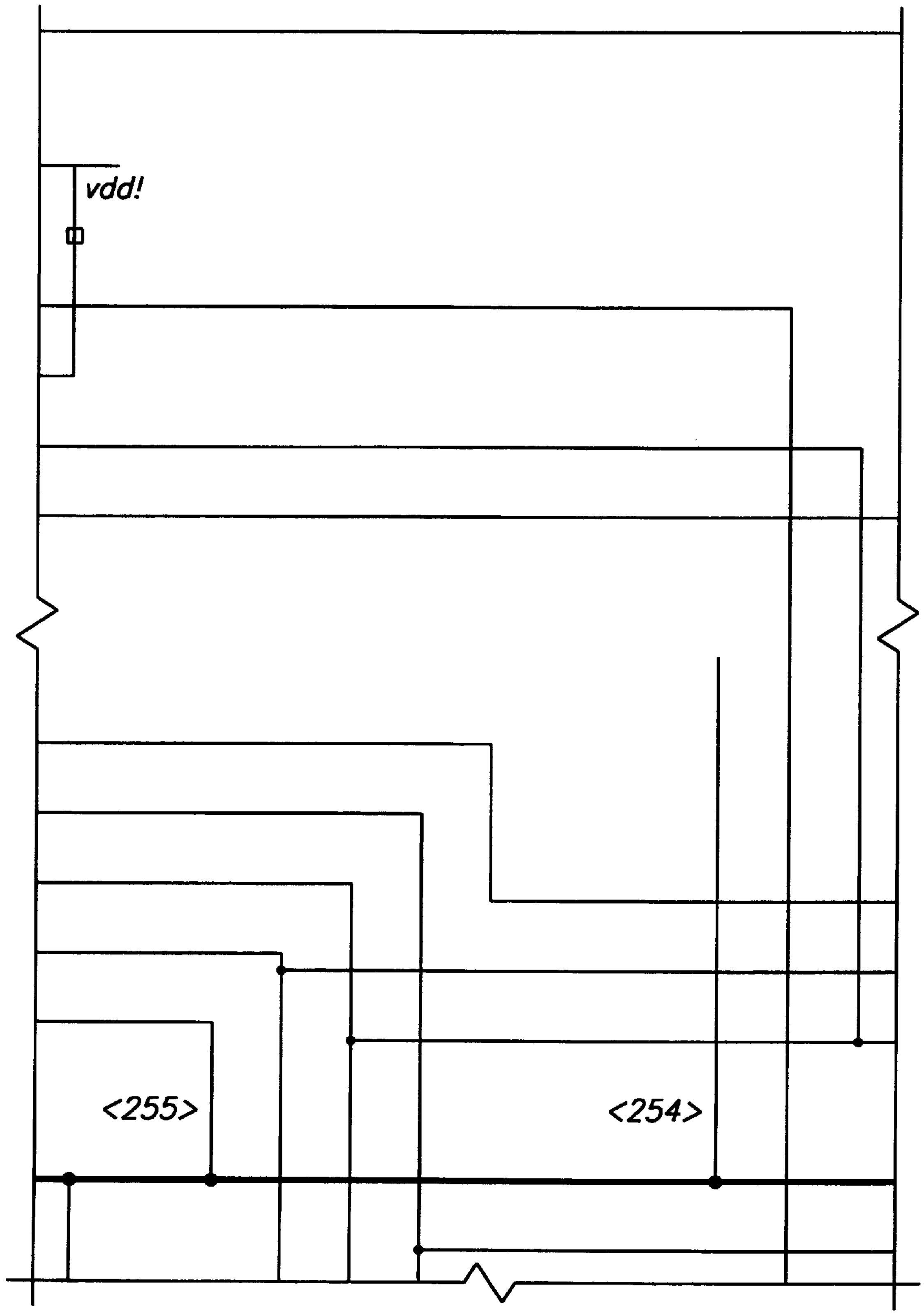
Figure 19A:
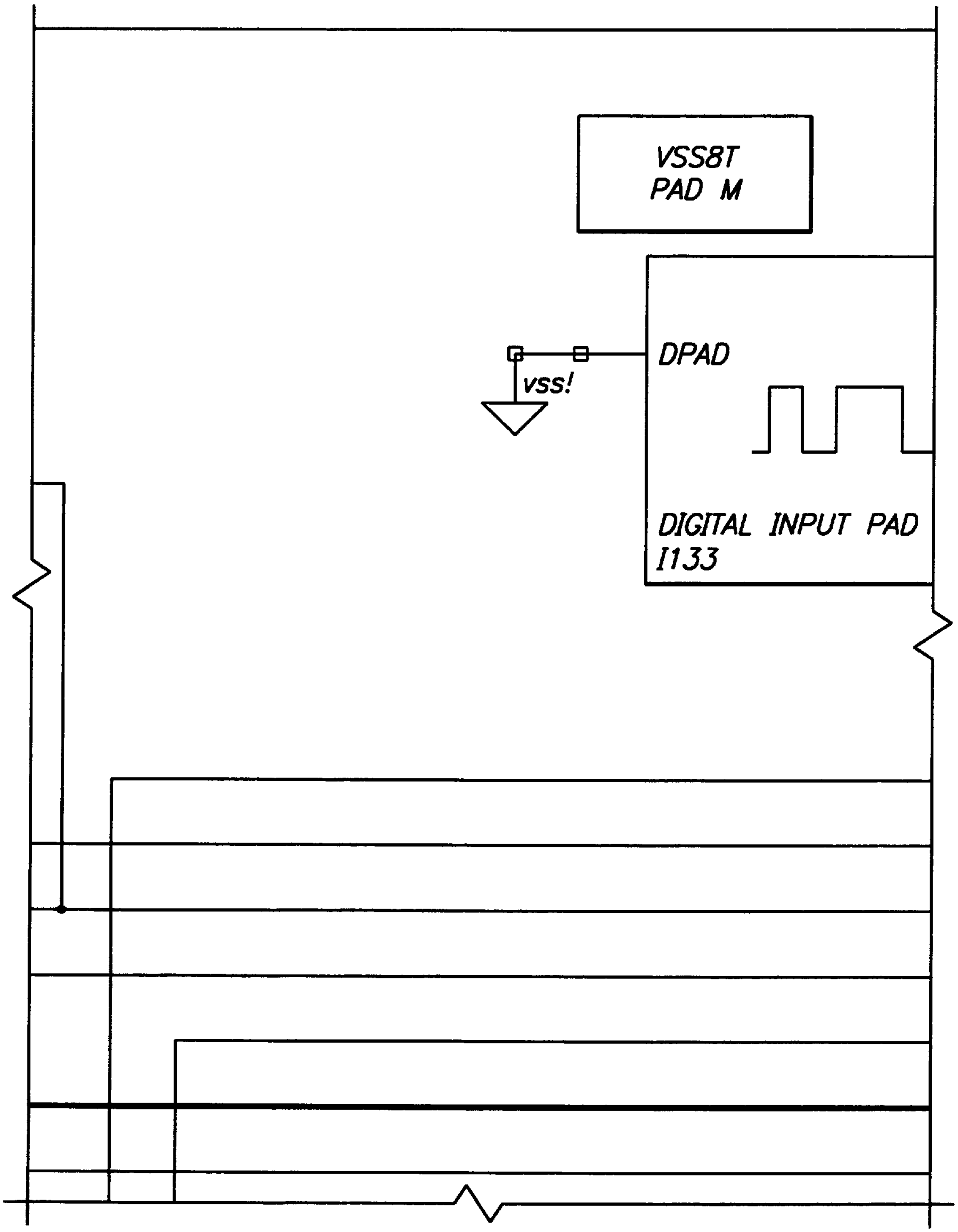
Figure 19A:
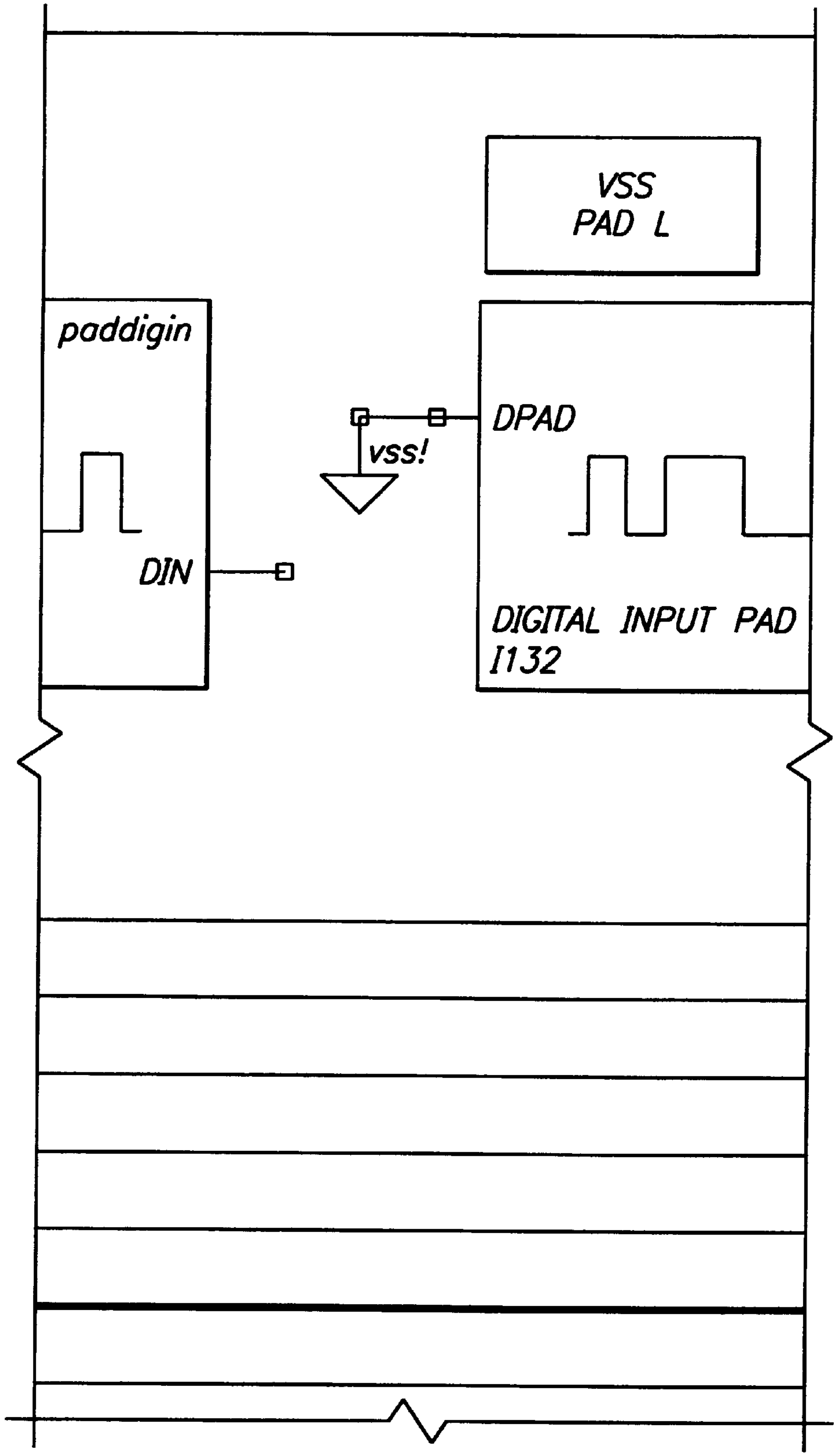
Figure 19A:
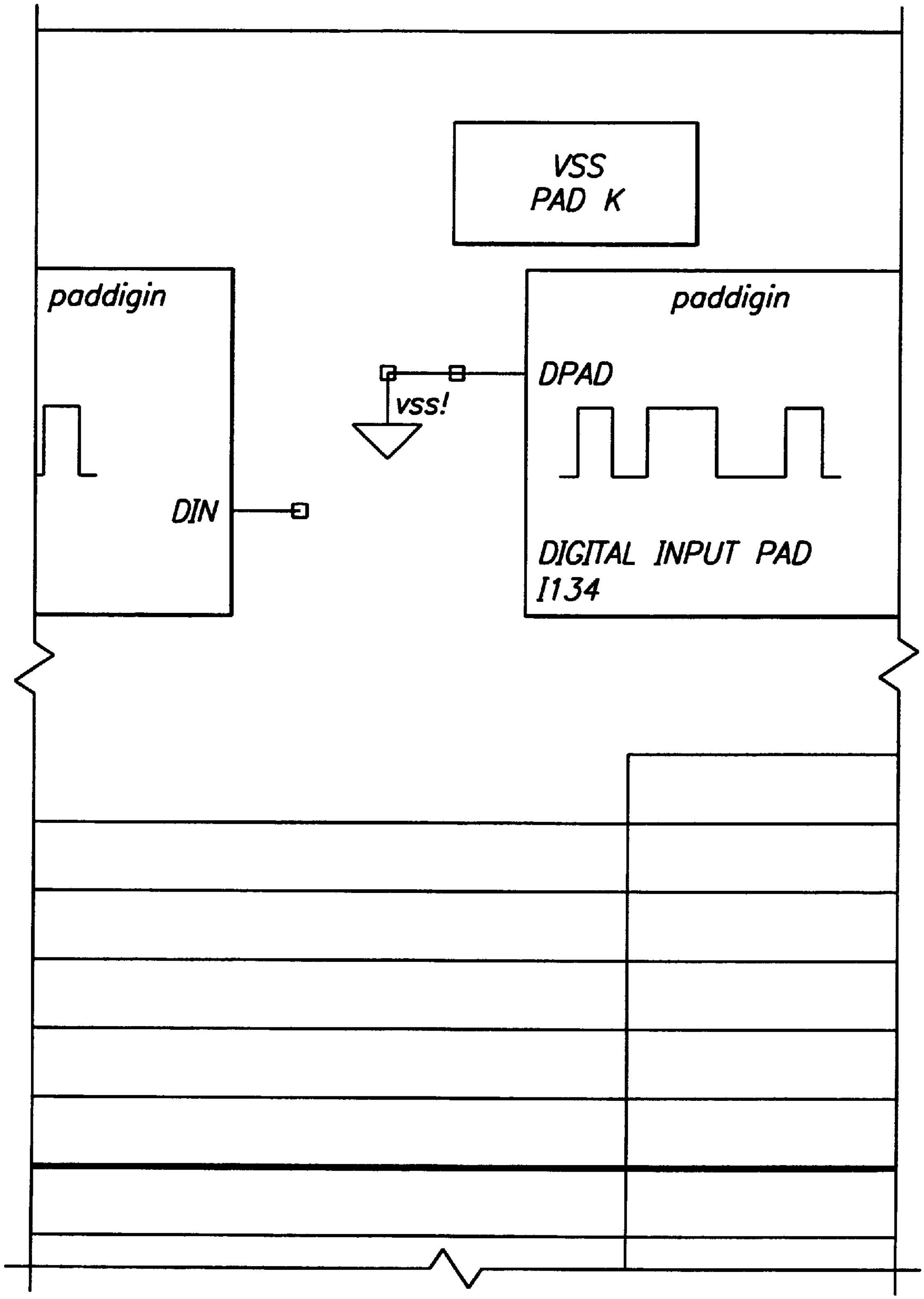
Figure 19A:
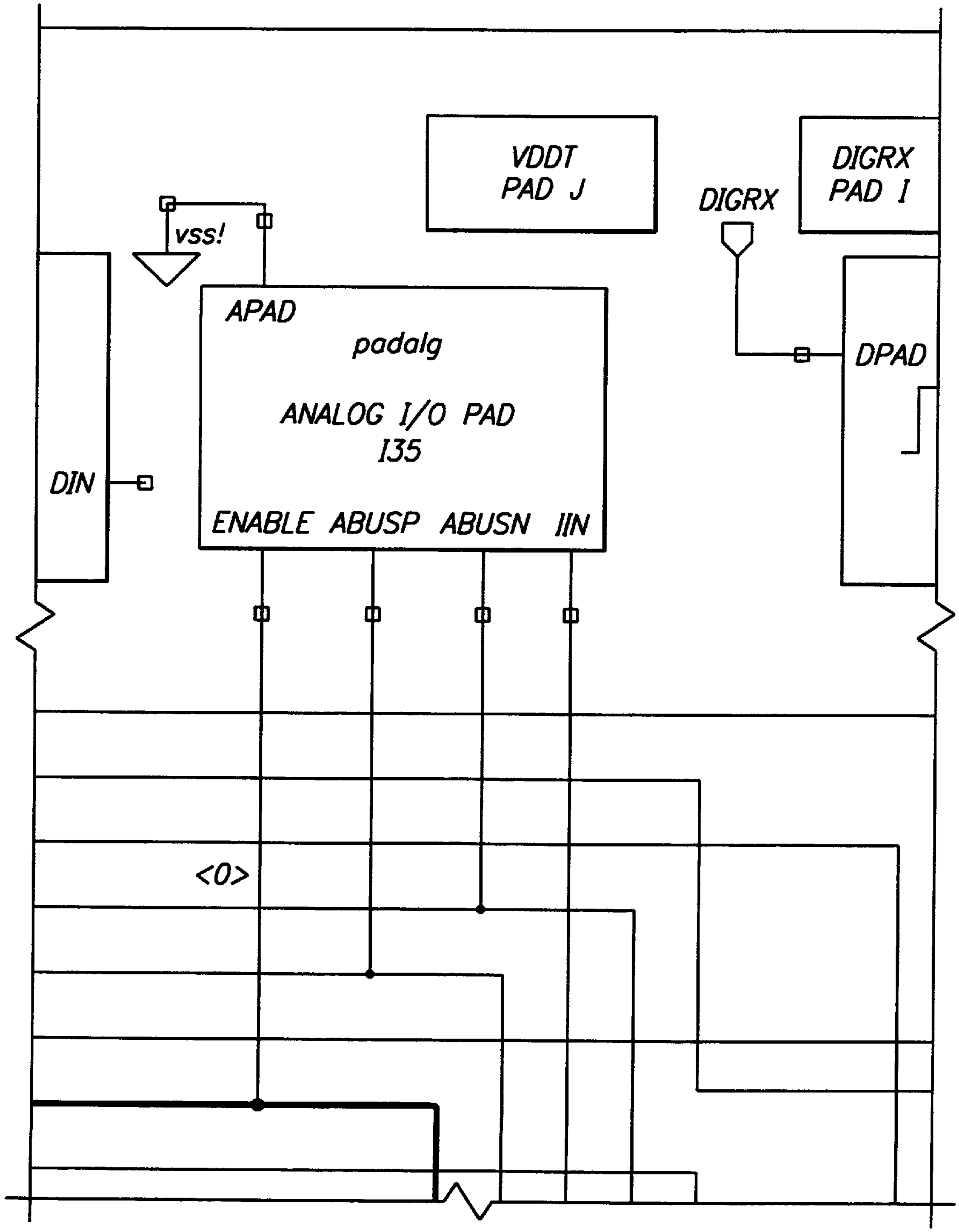
Figure 19A:
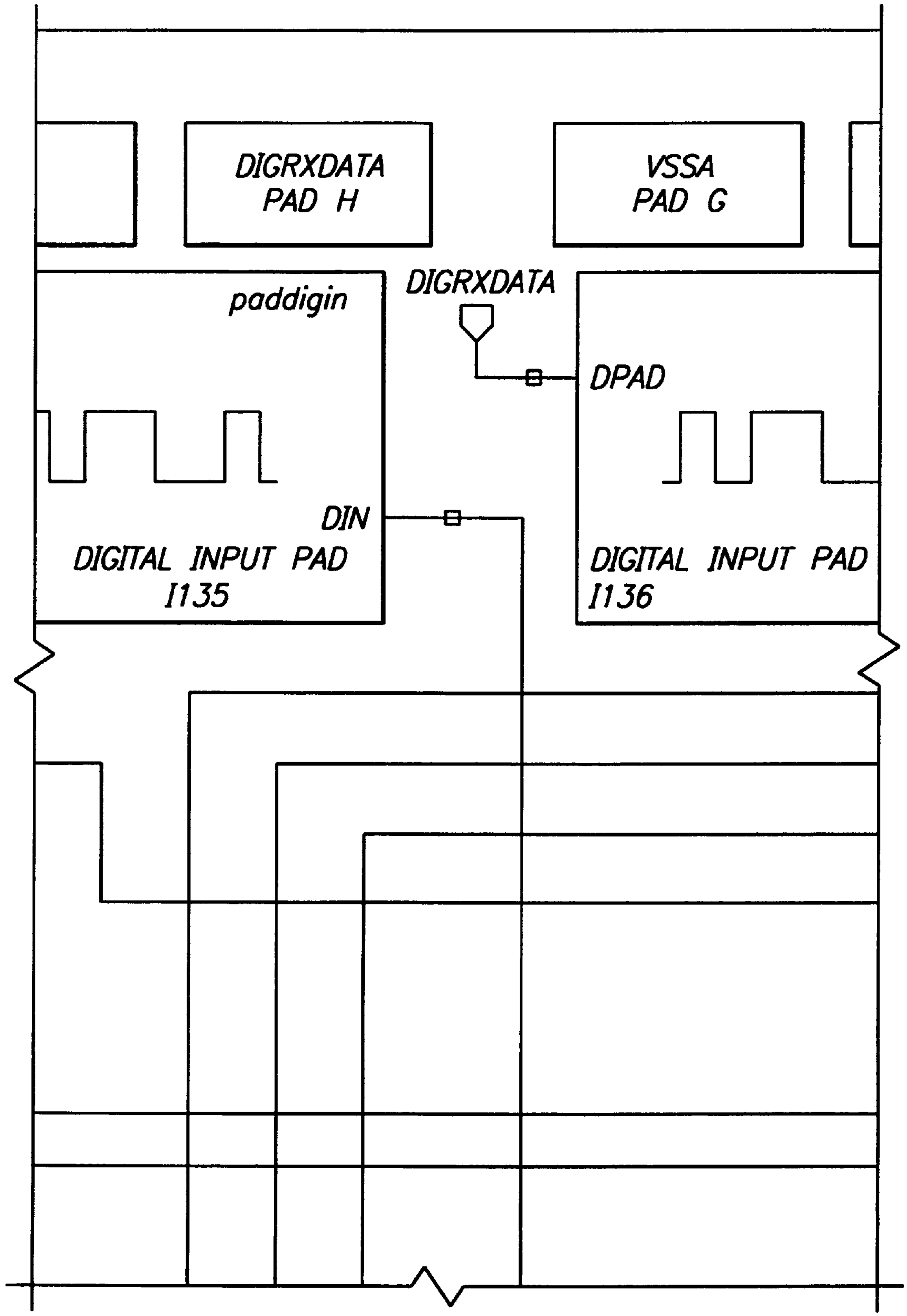
Figure 19A:
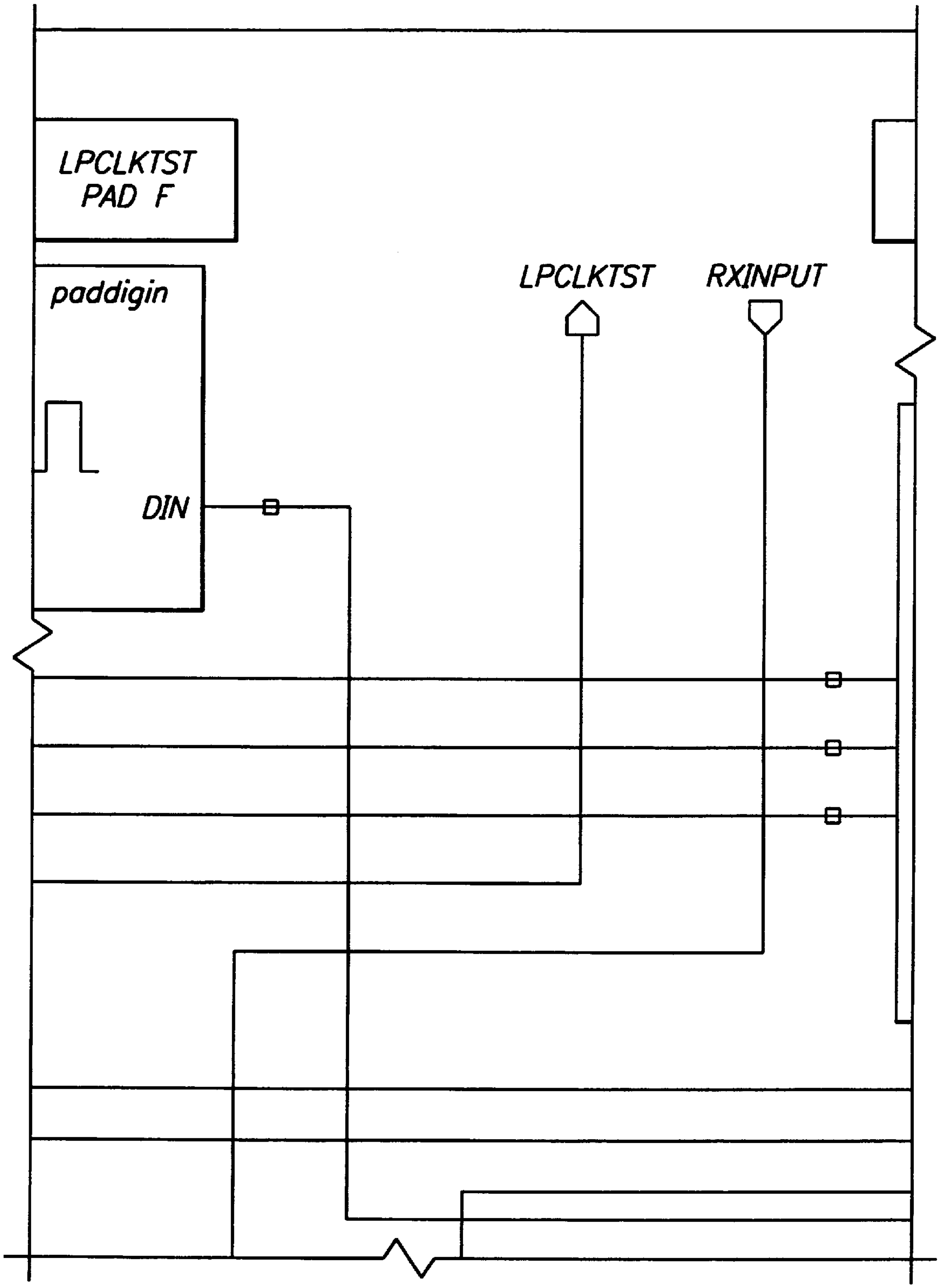
Figure 19A:
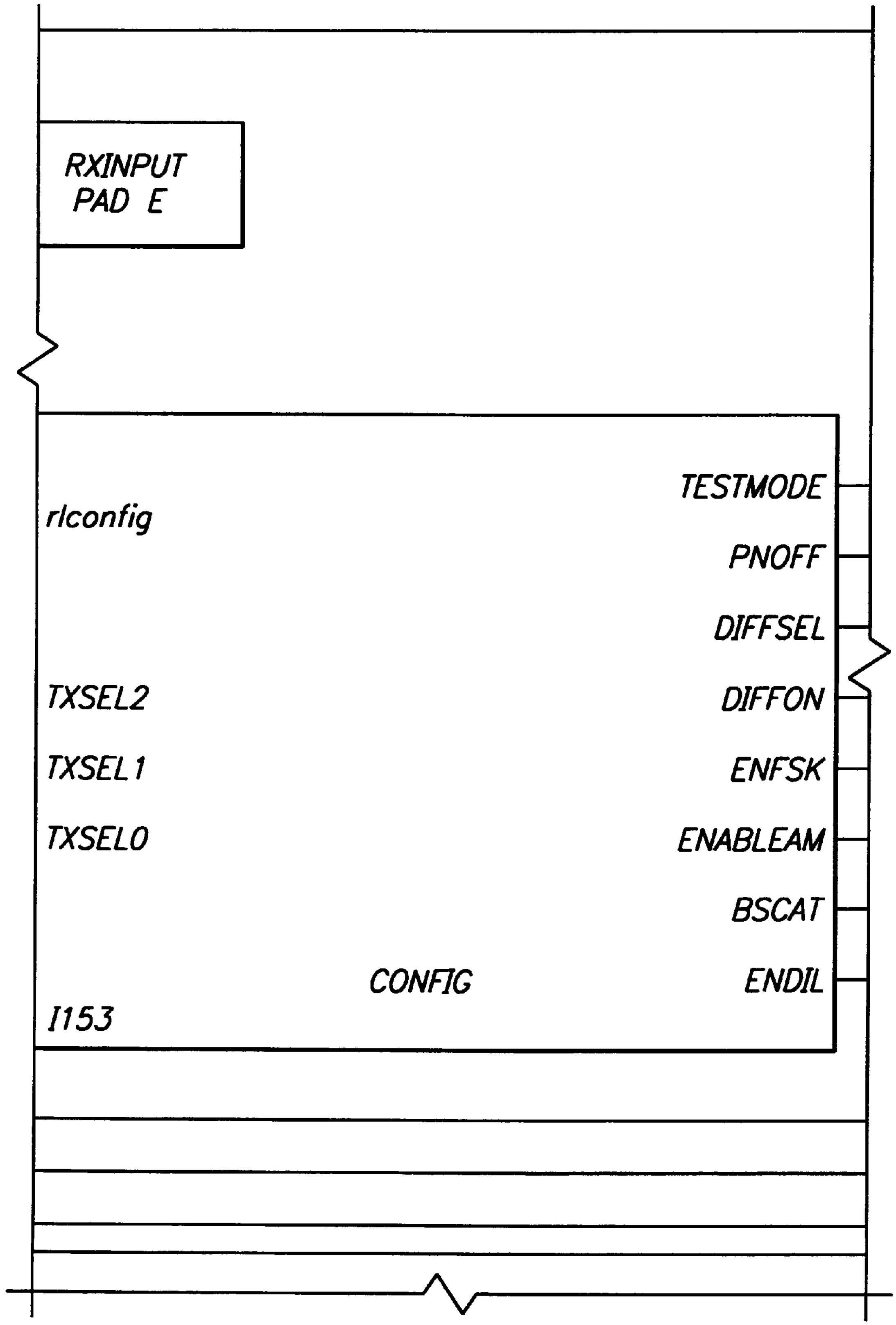
Figure 19A:
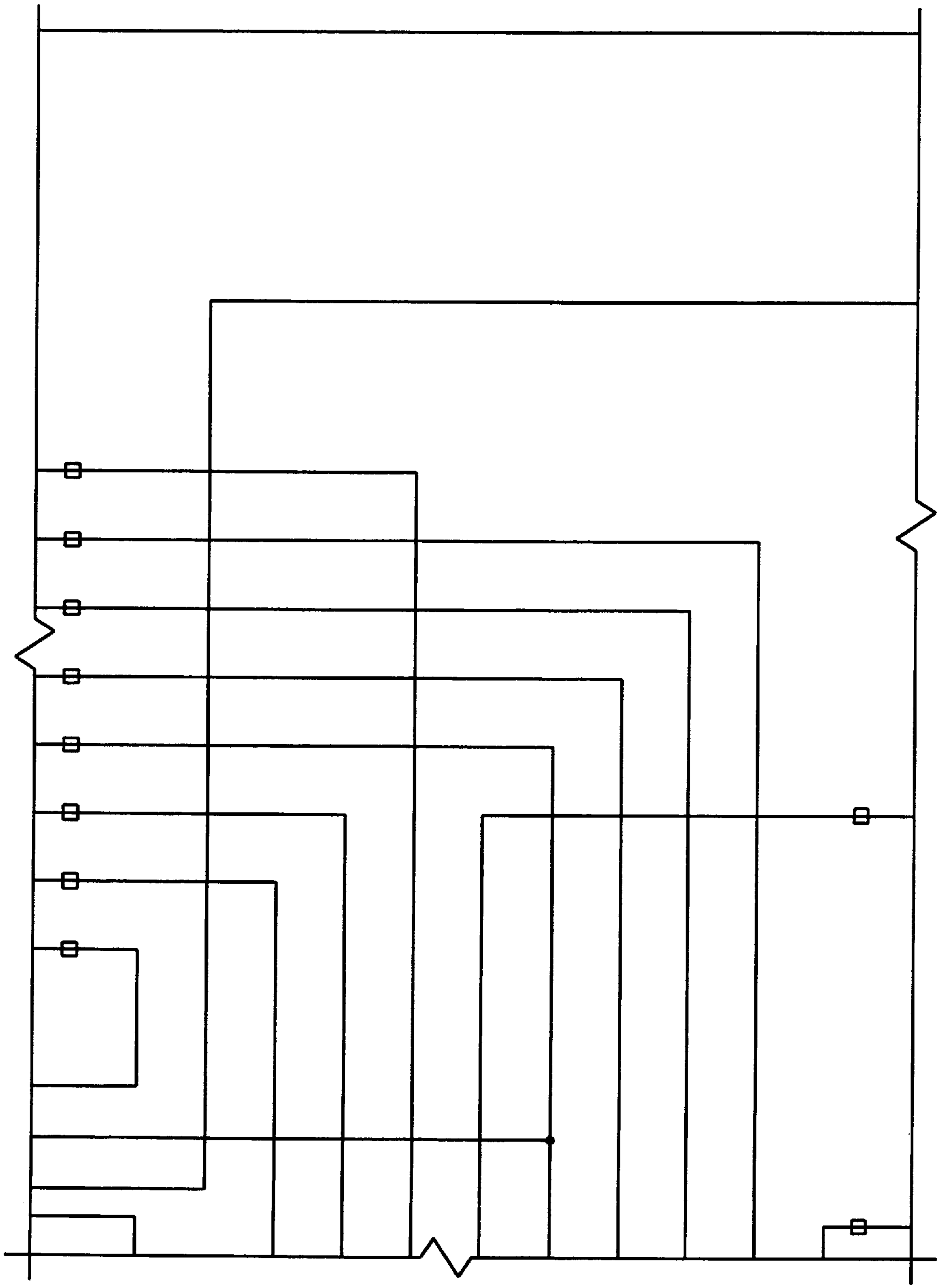
Figure 19A:
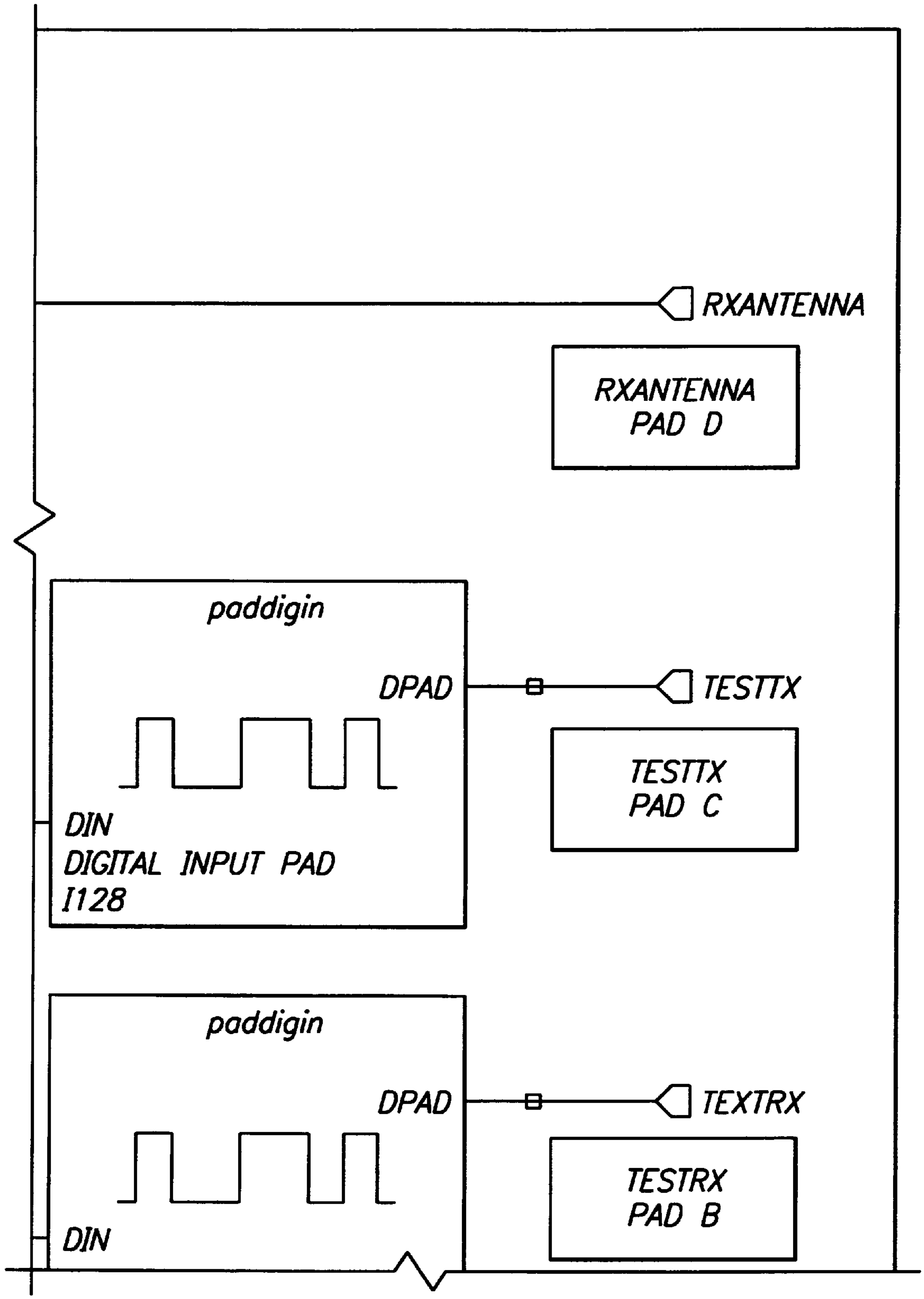
Figure 198A:
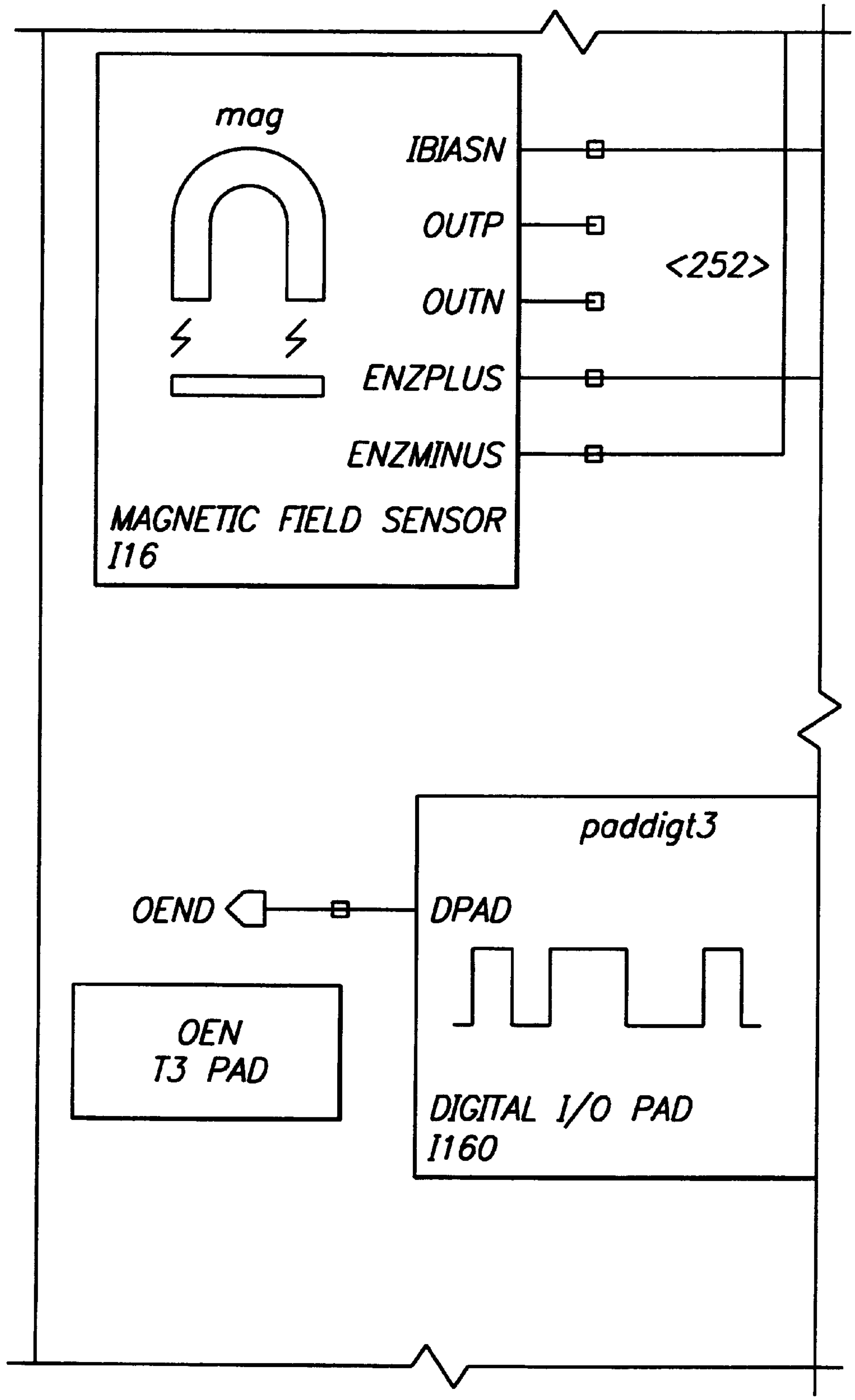
Figure 19B:
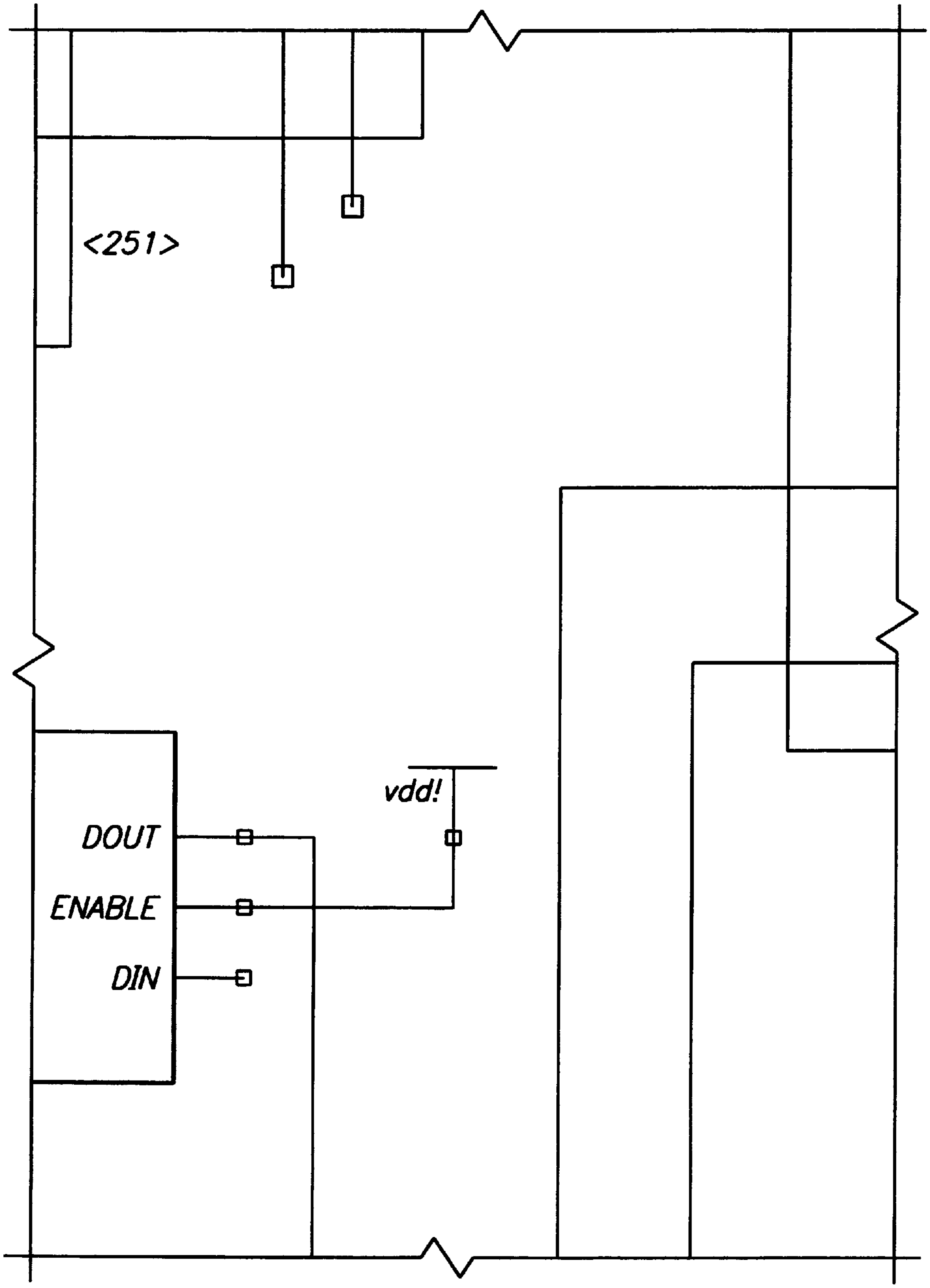
Figure 19B:
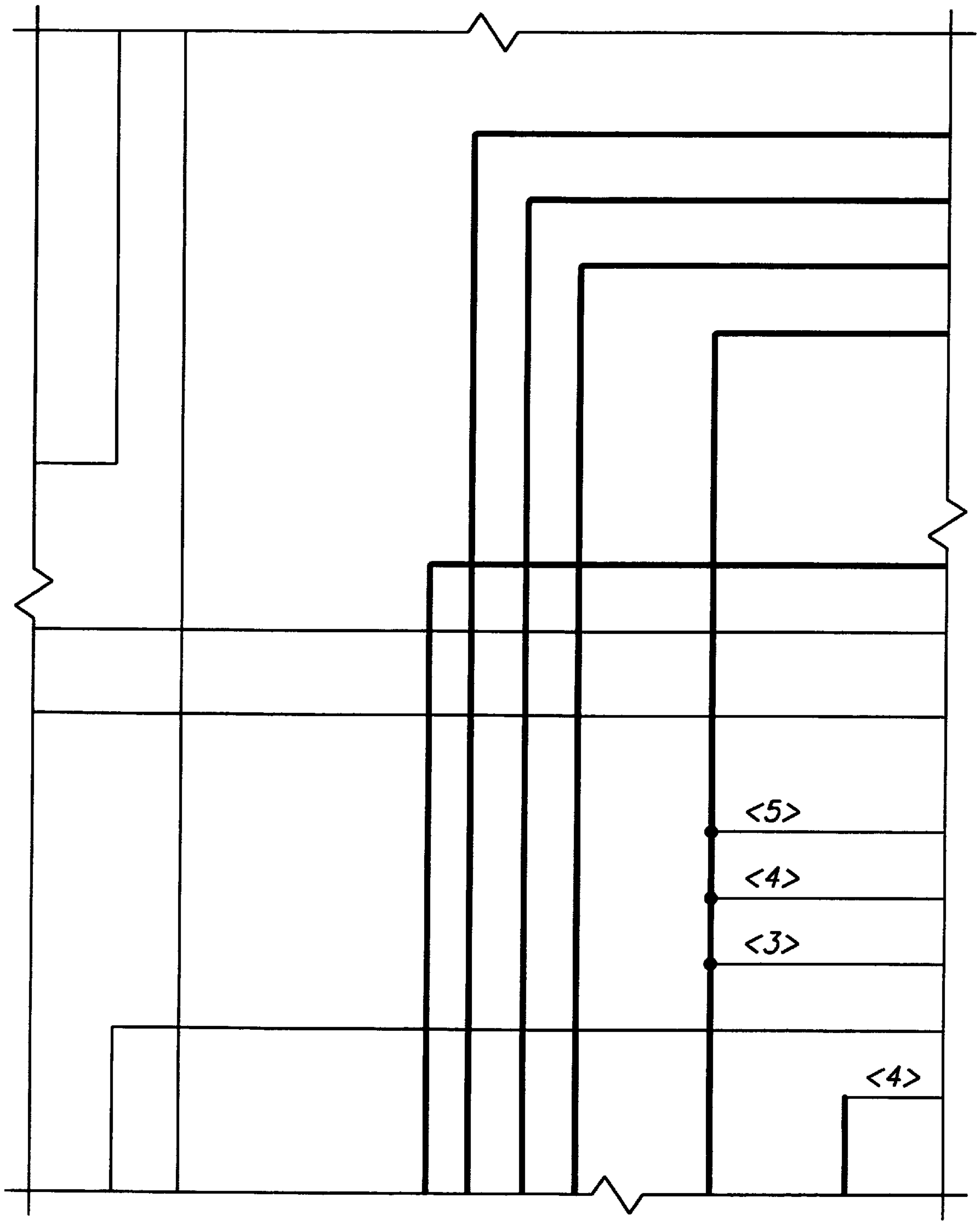
Figure 19B:
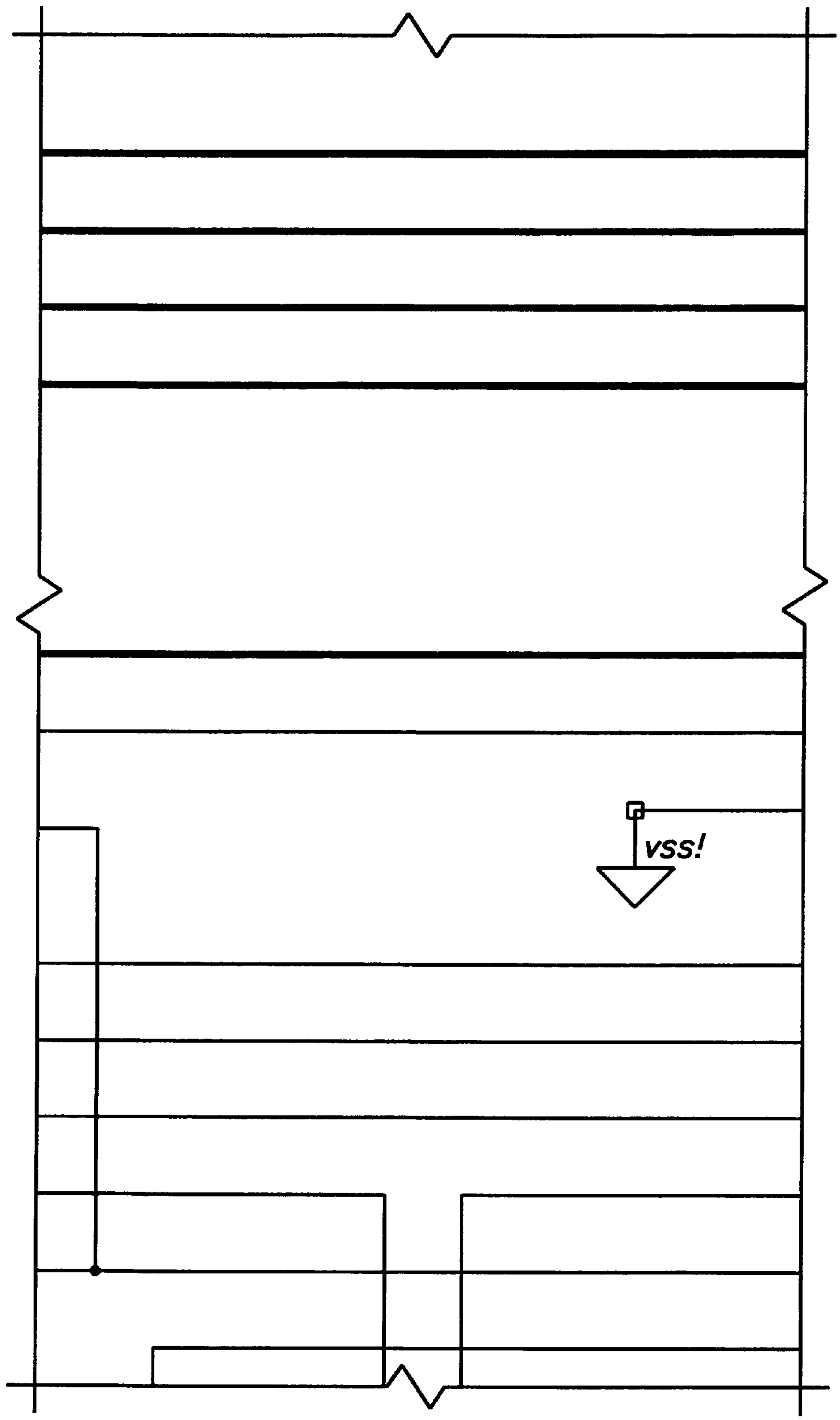
Figure 19B:
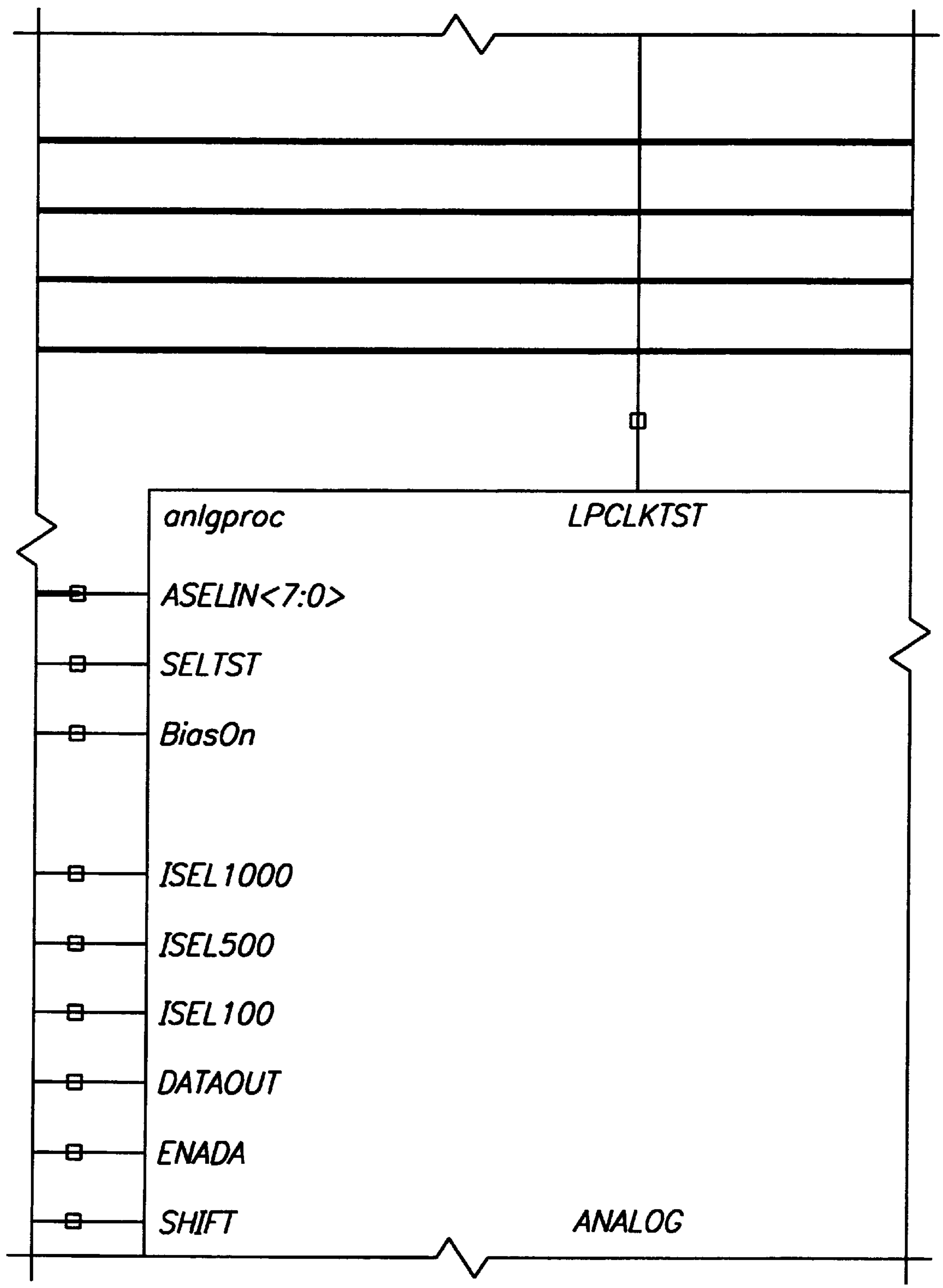
Figure 19B:
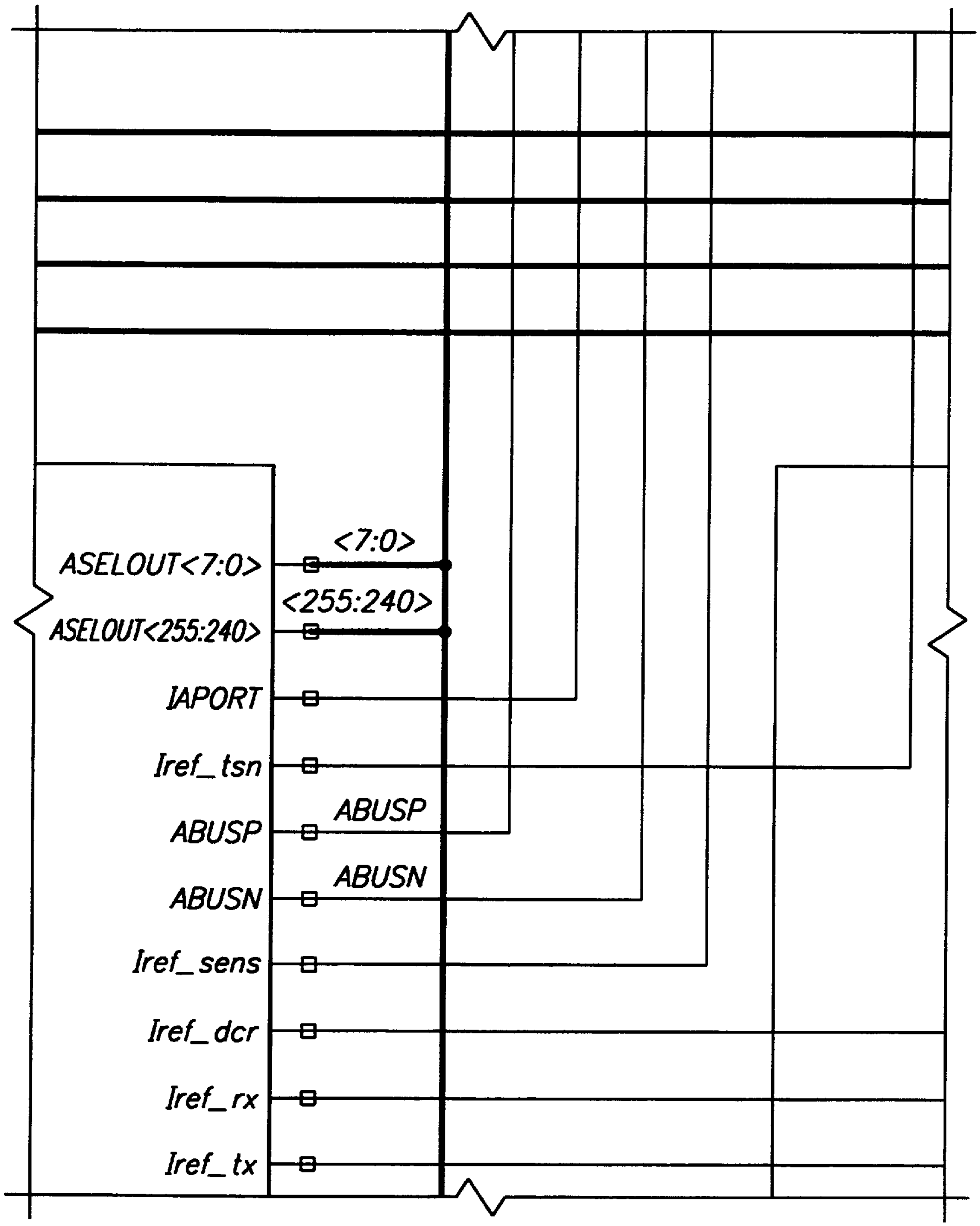
Figure 19B:
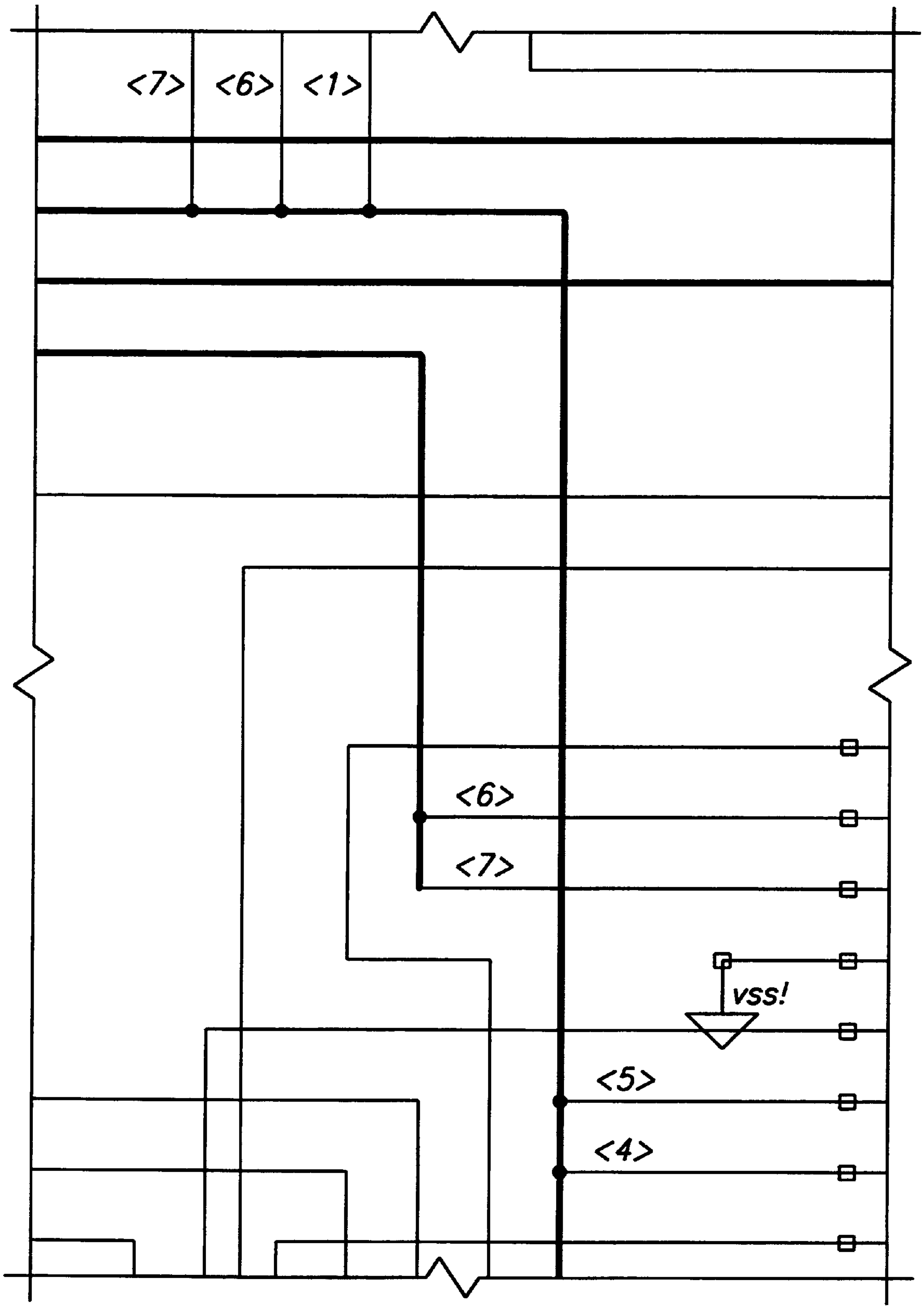
Figure 19B:
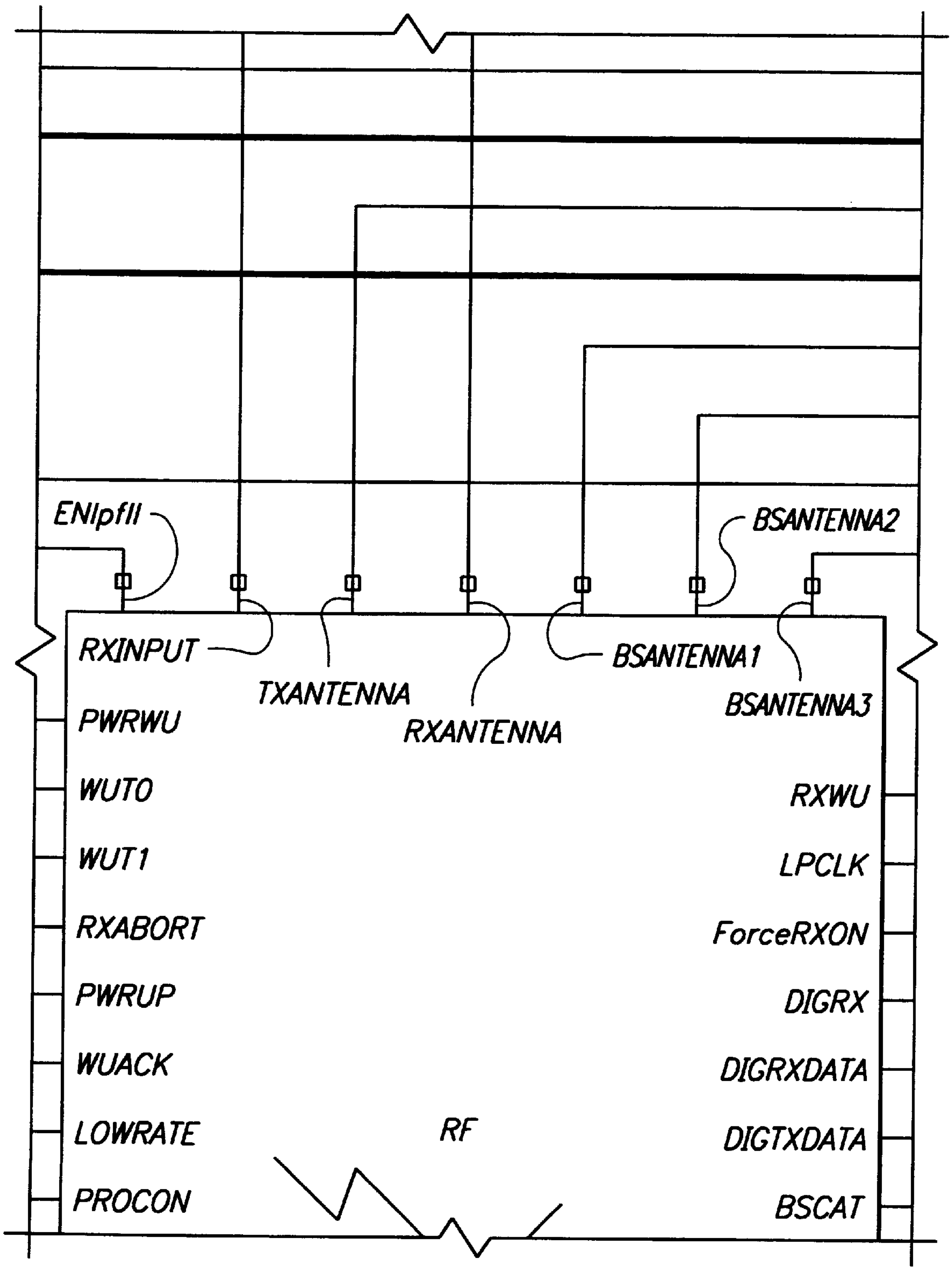
Figure 19B:
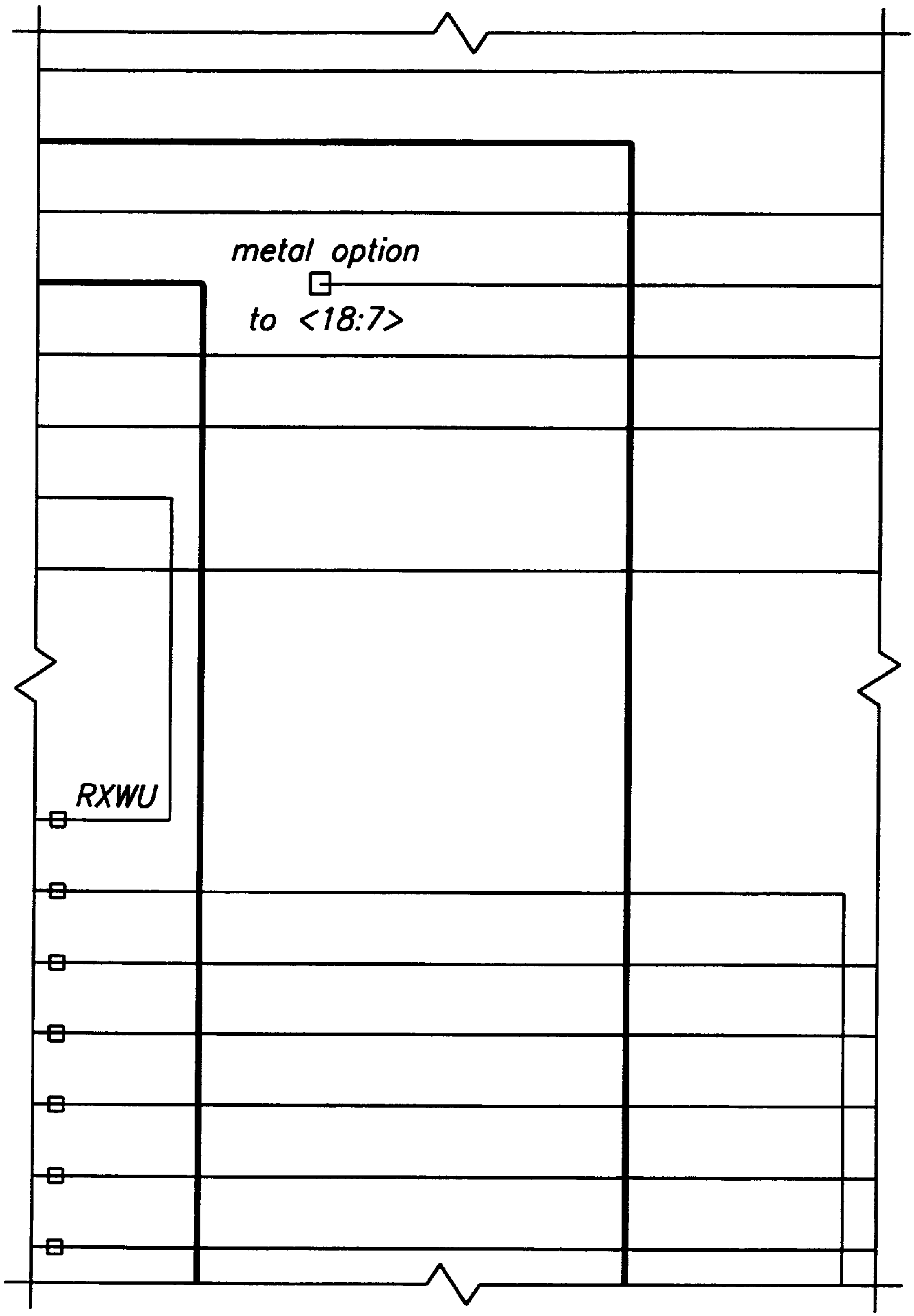
Figure 19B:
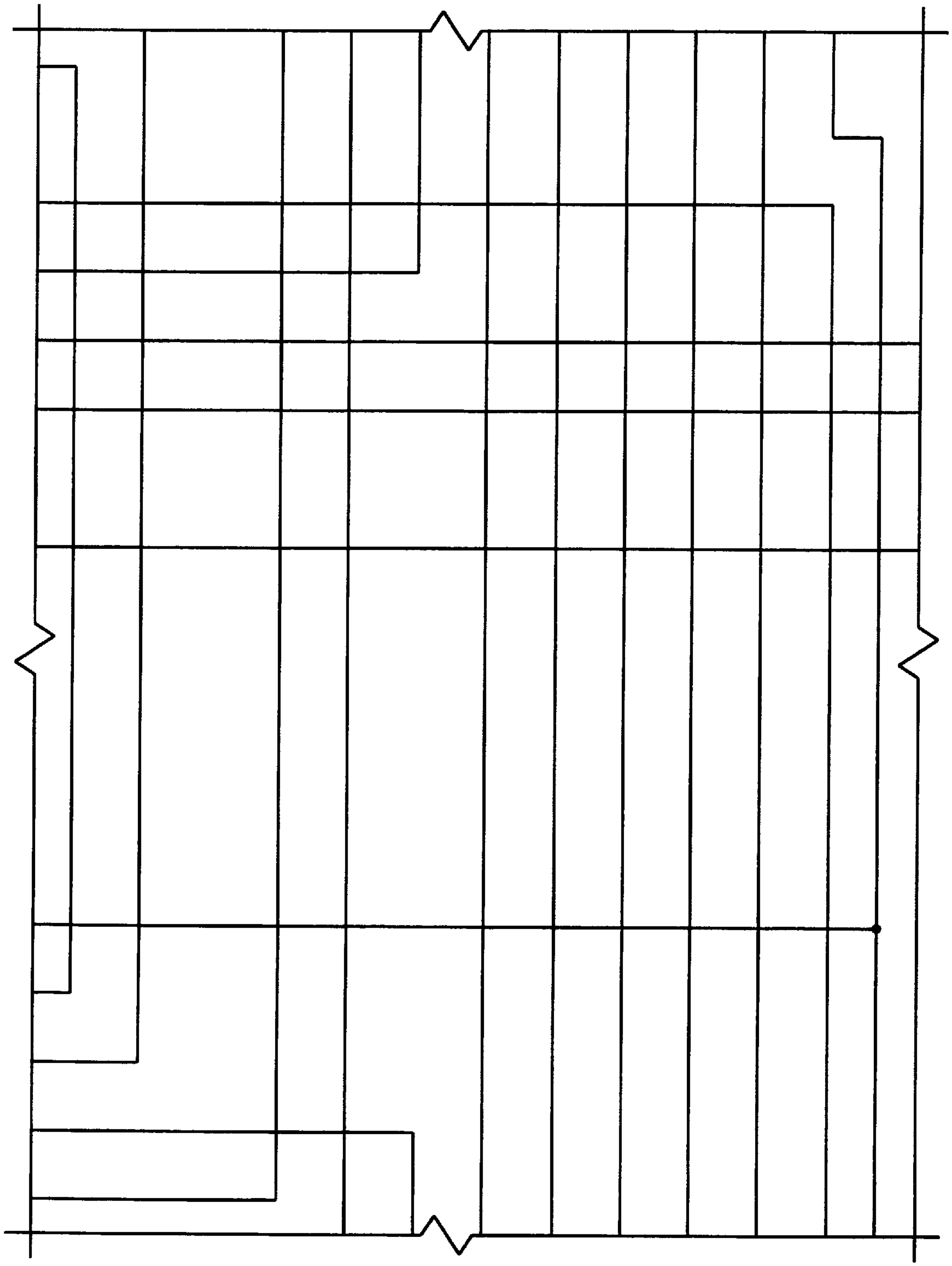
Figure 19B:
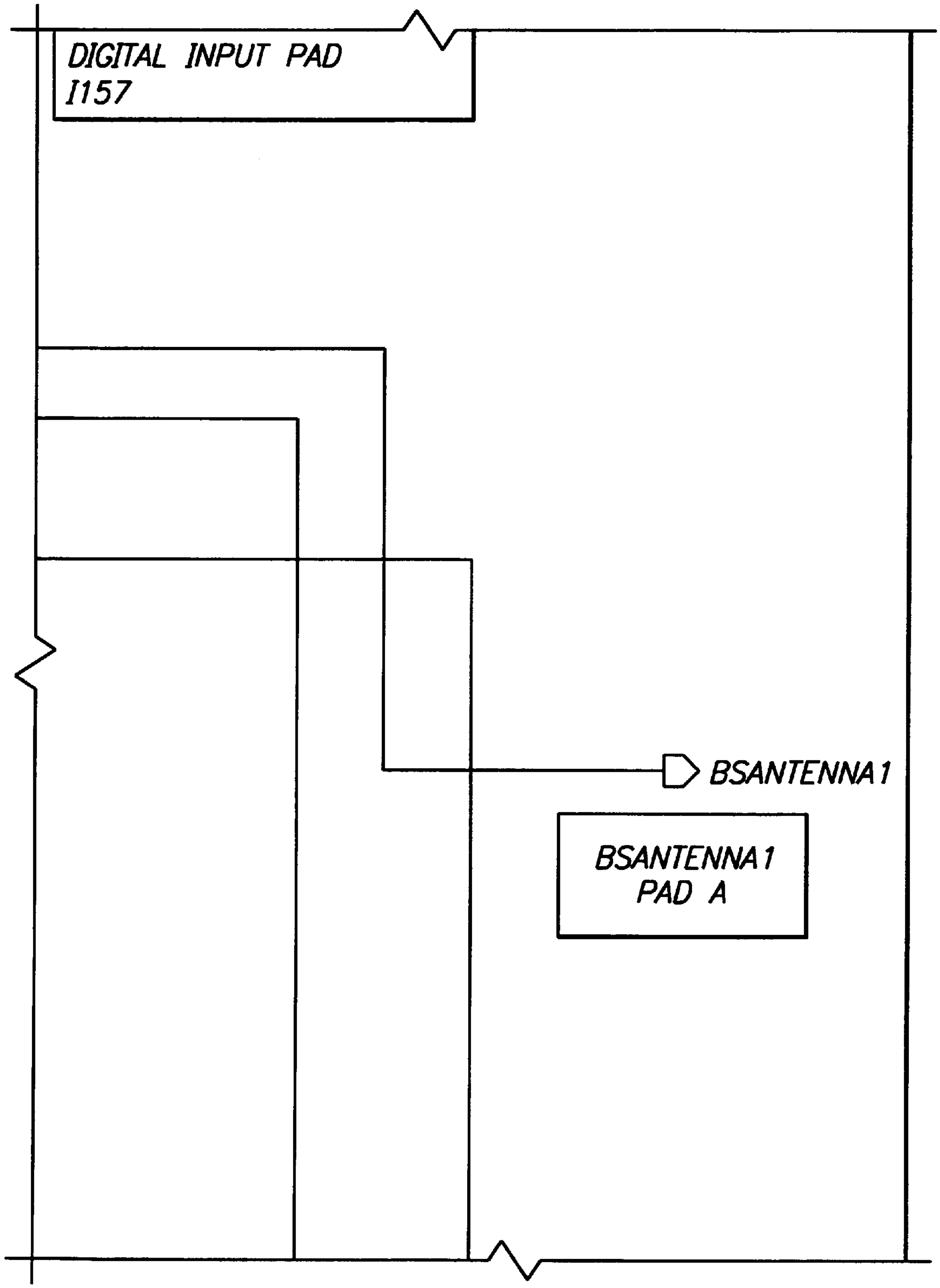
Figure 19C:
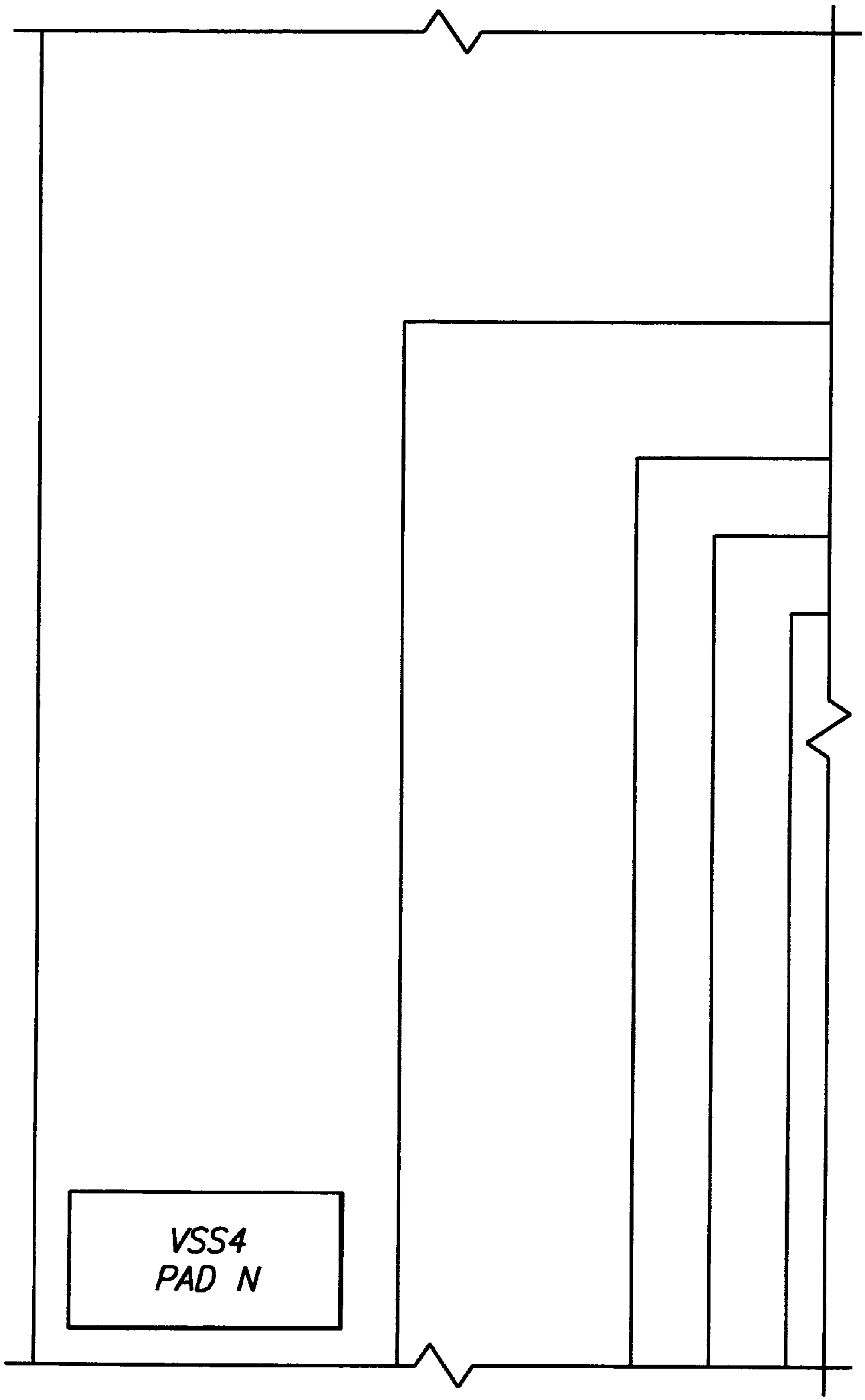
Figure 19C:
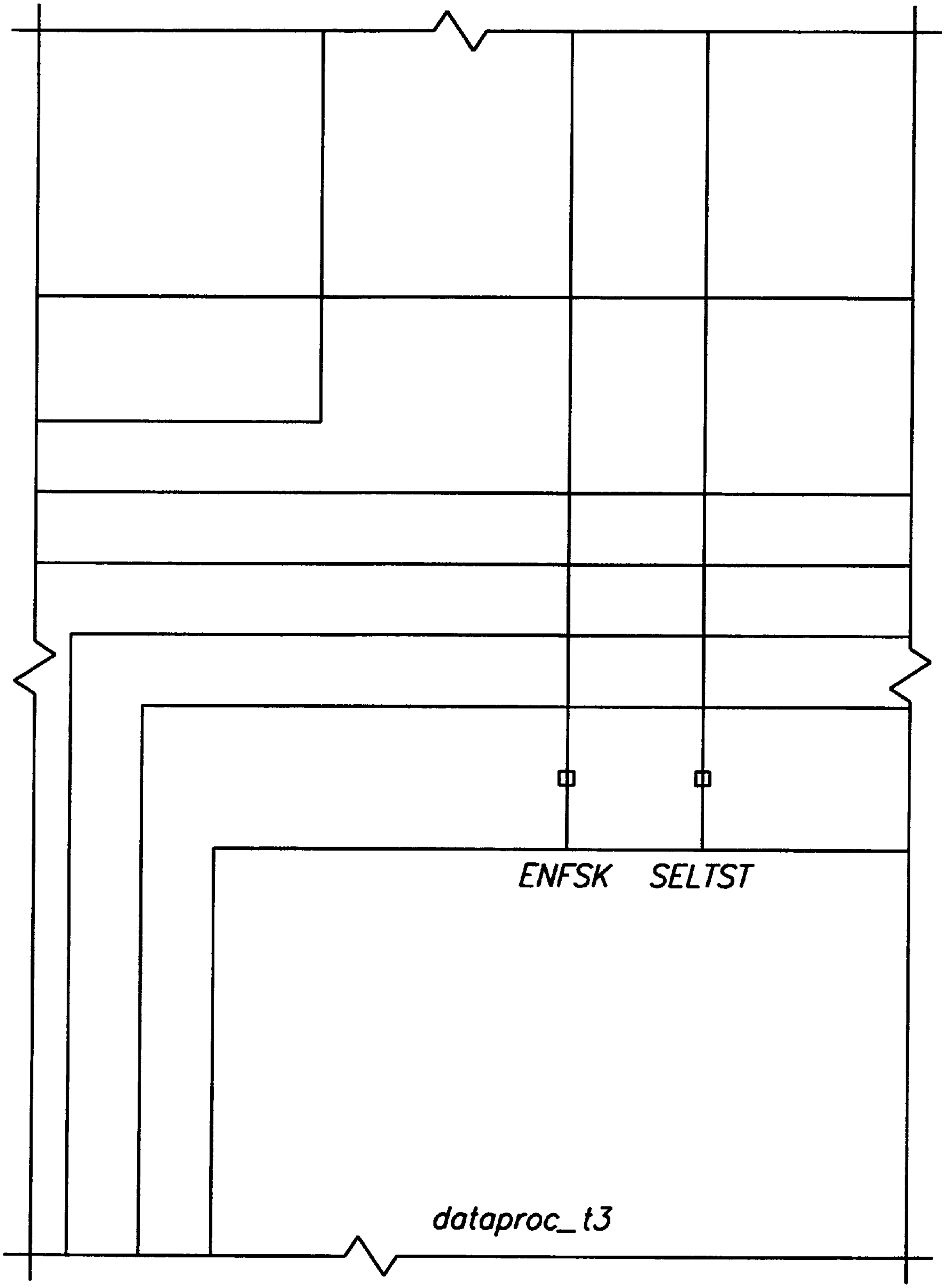
Figure 19C:
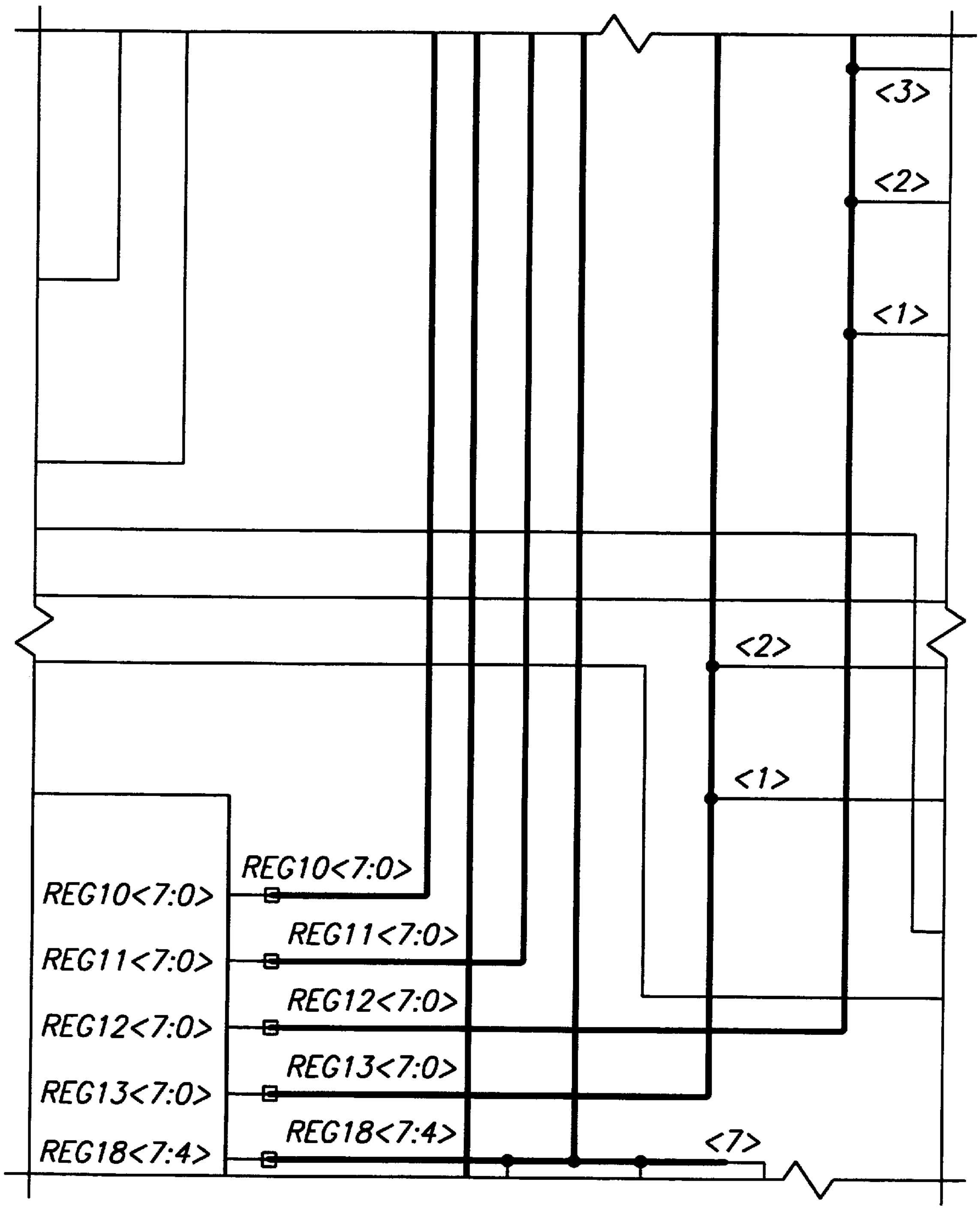
Figure 19C:
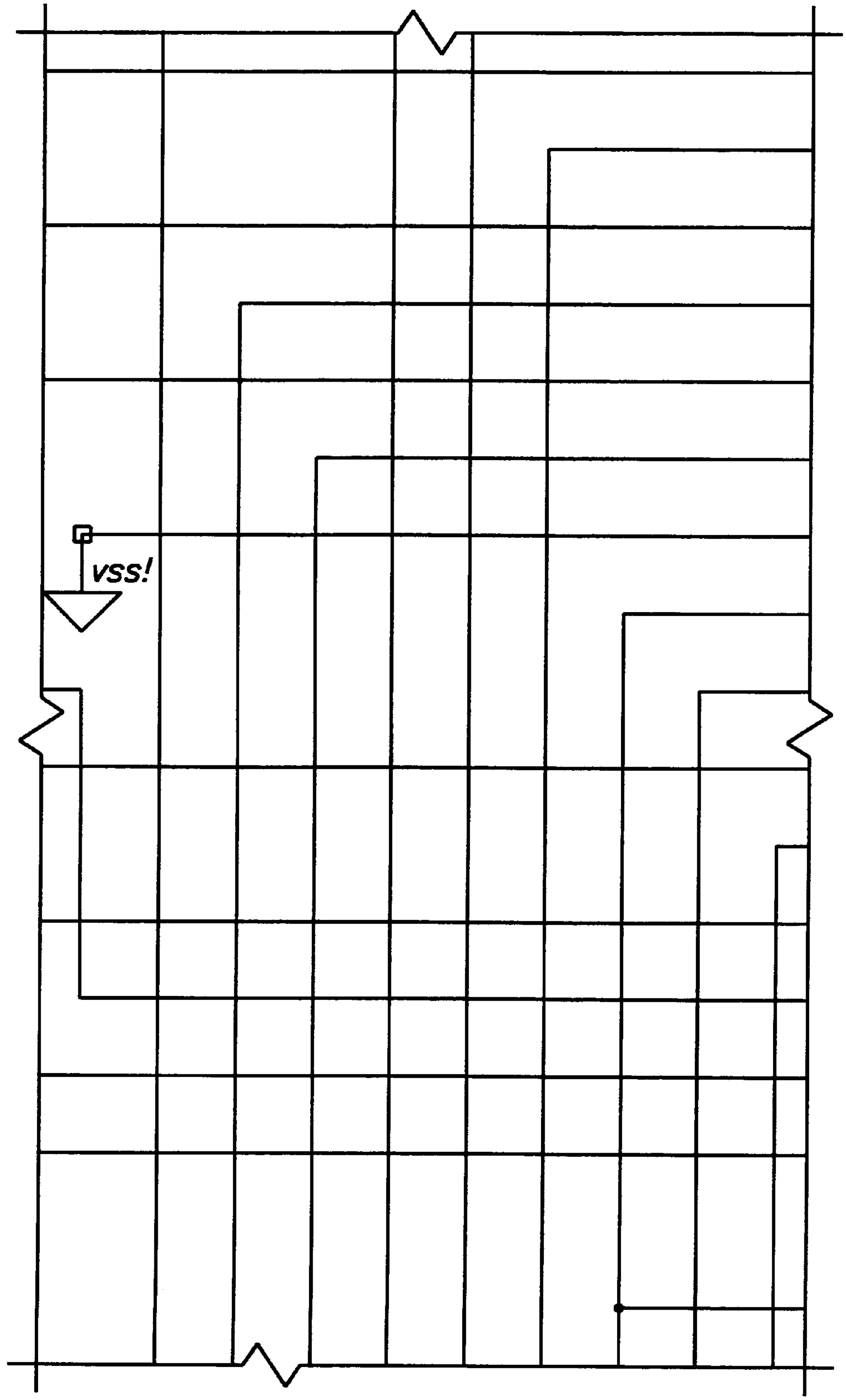
Figure 19C:
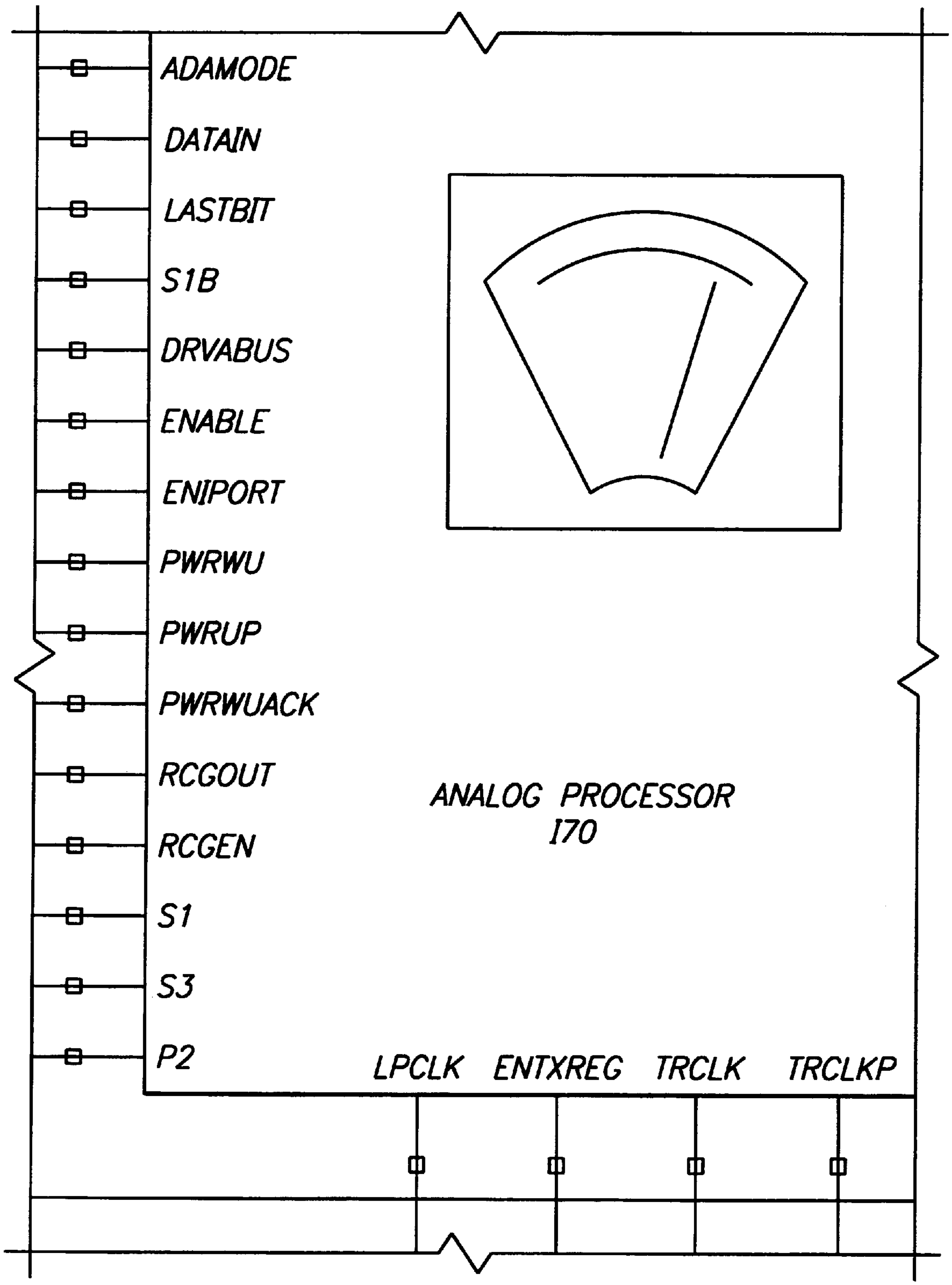
Figure 19C:
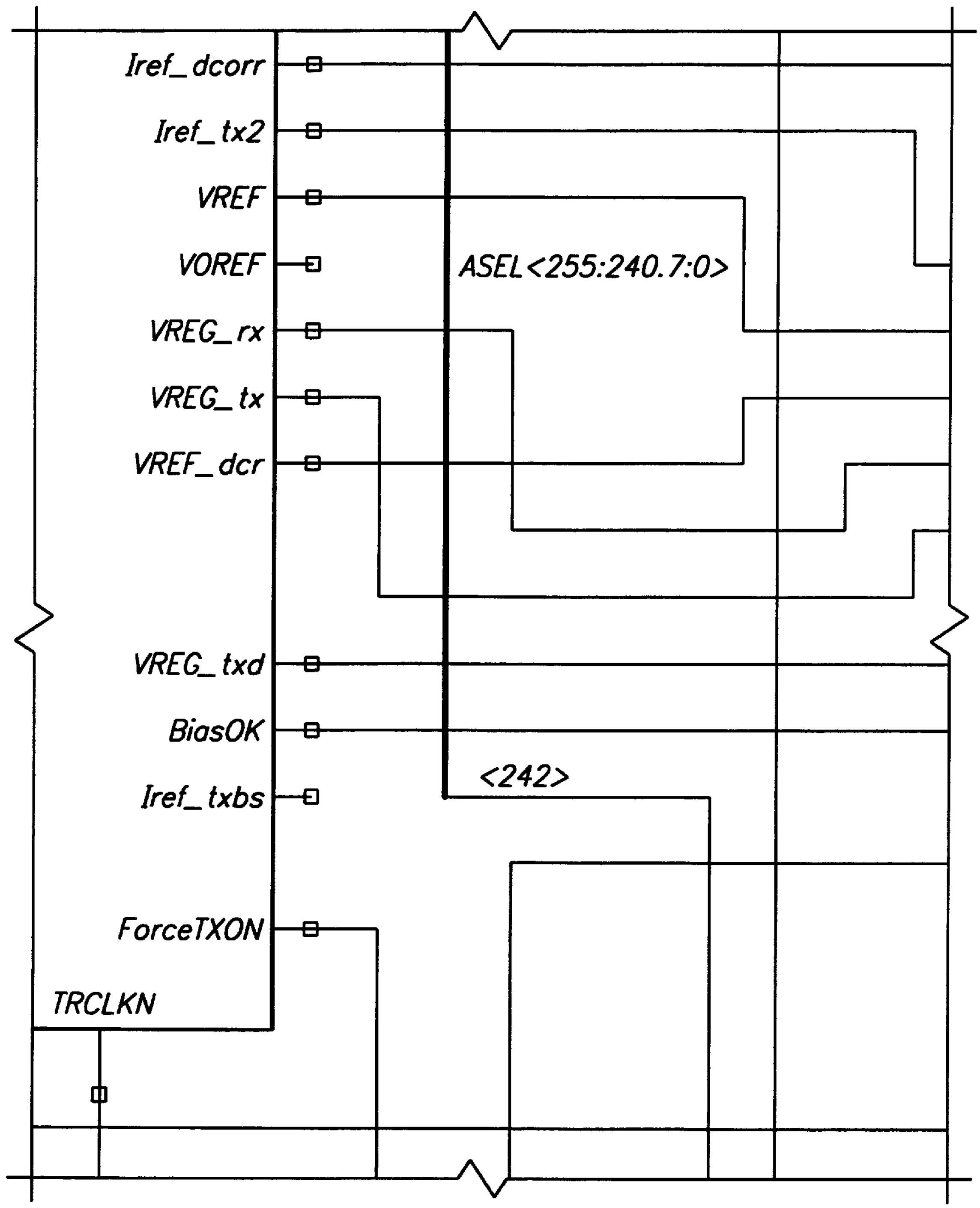
Figure 19C:
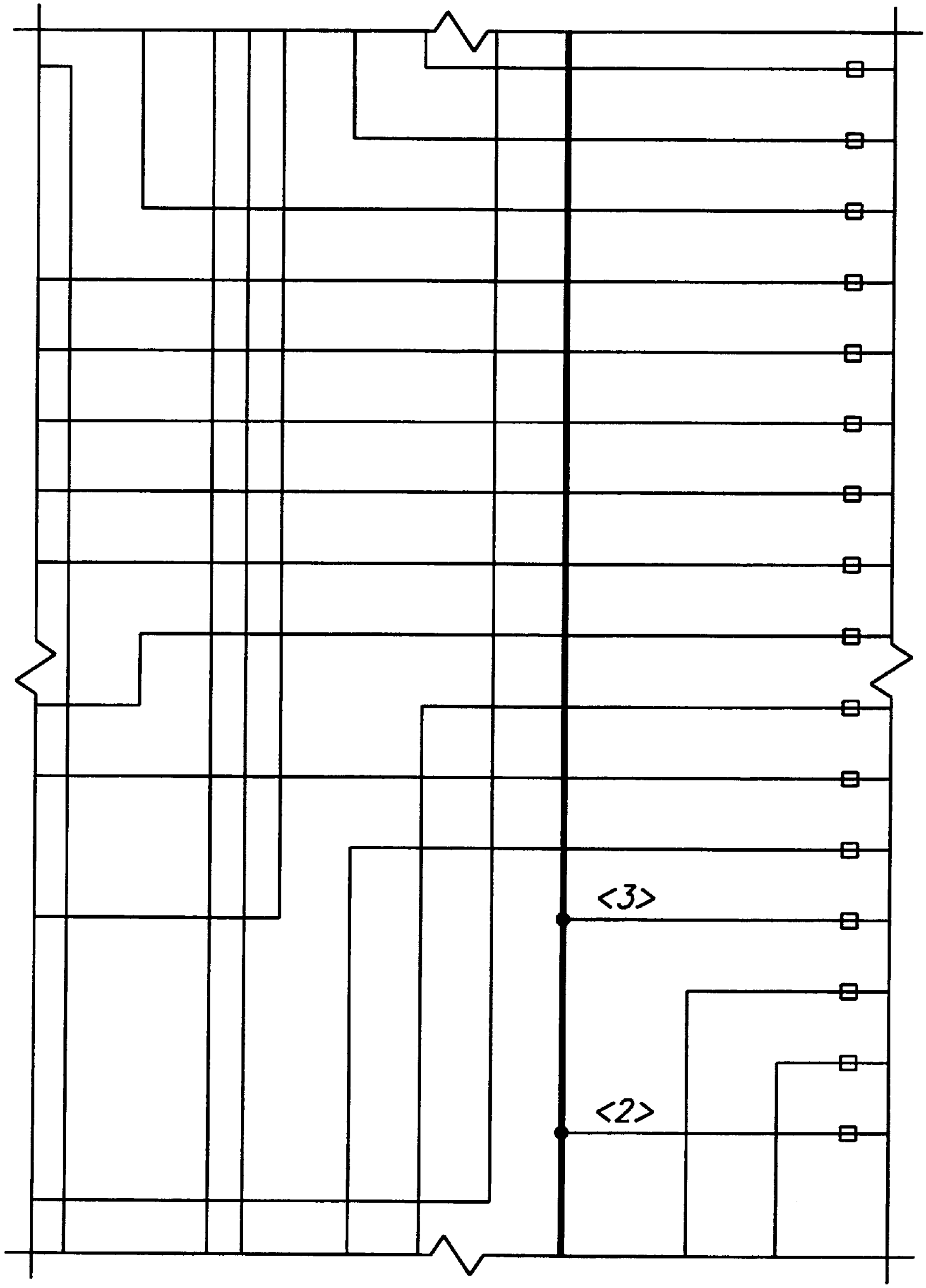
Figure 19C:
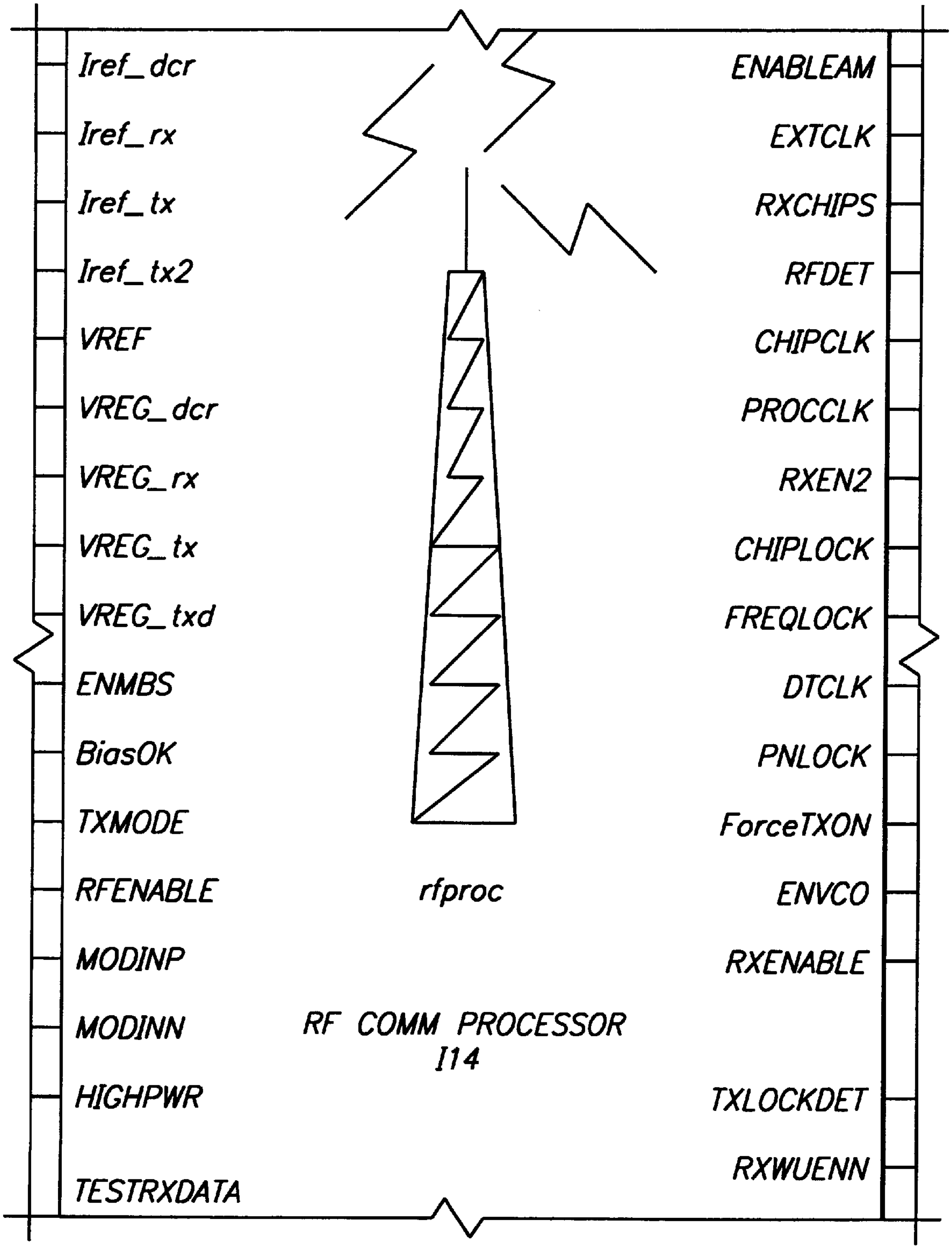
Figure 19C:
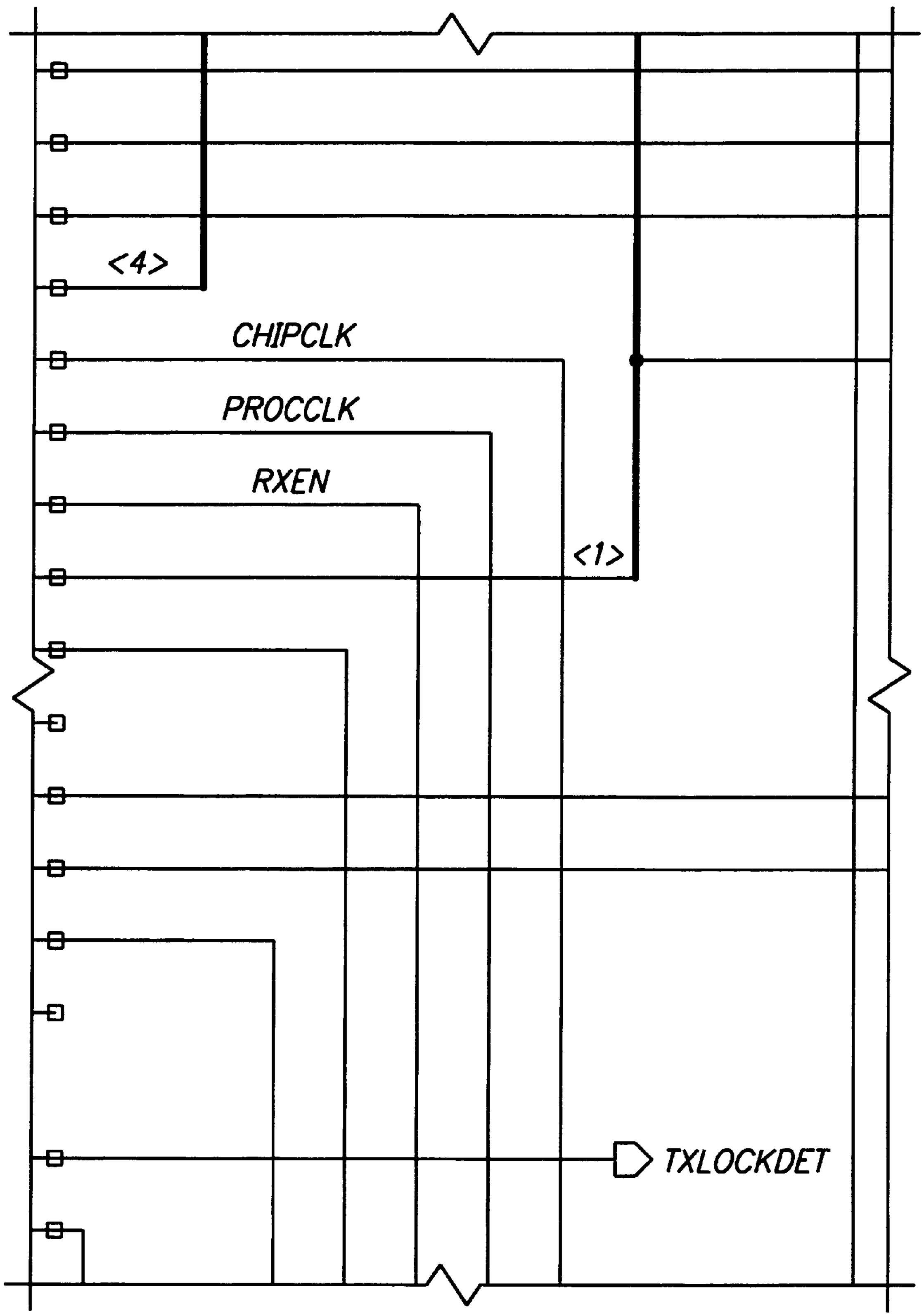
Figure 19C:
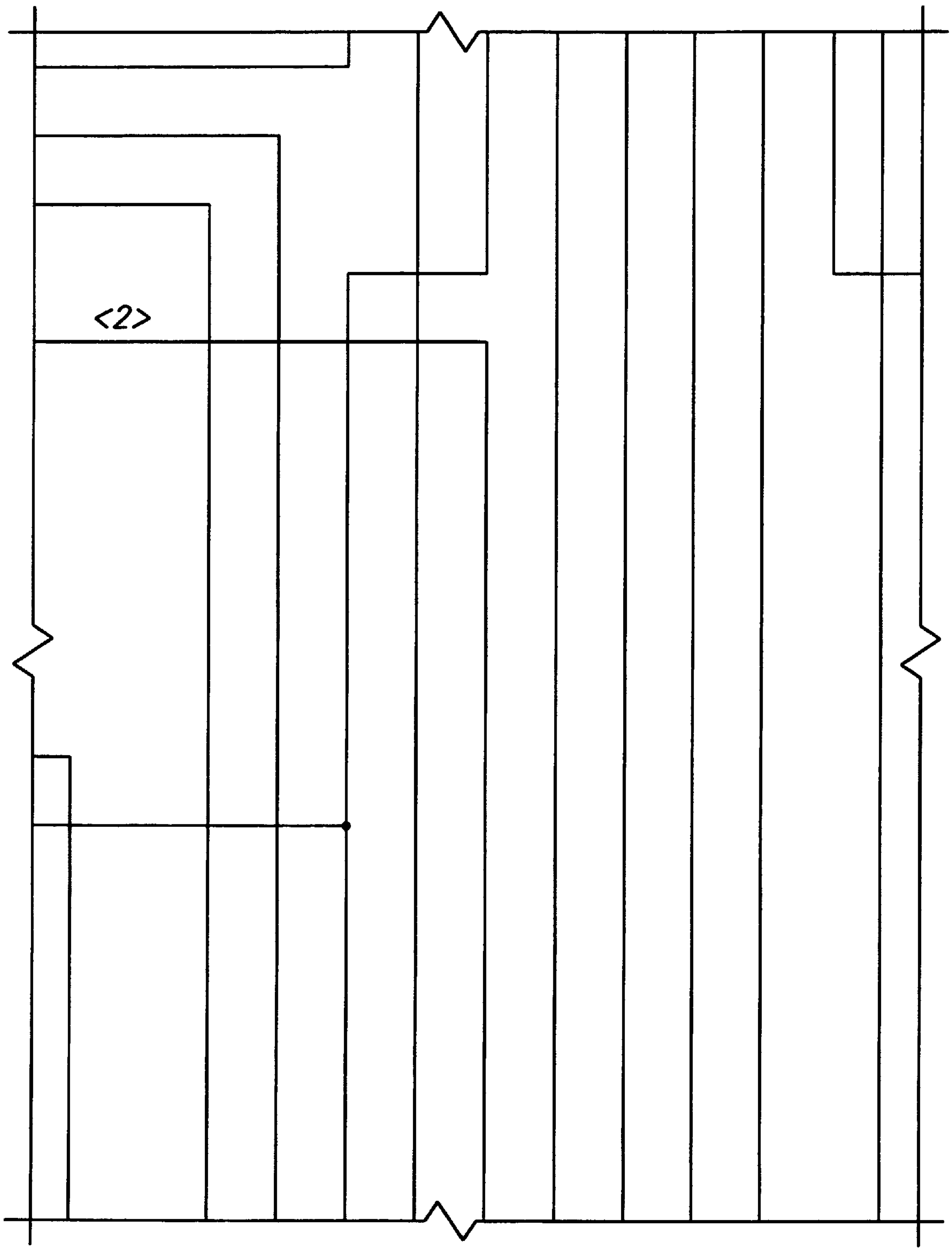
Figure 19C:
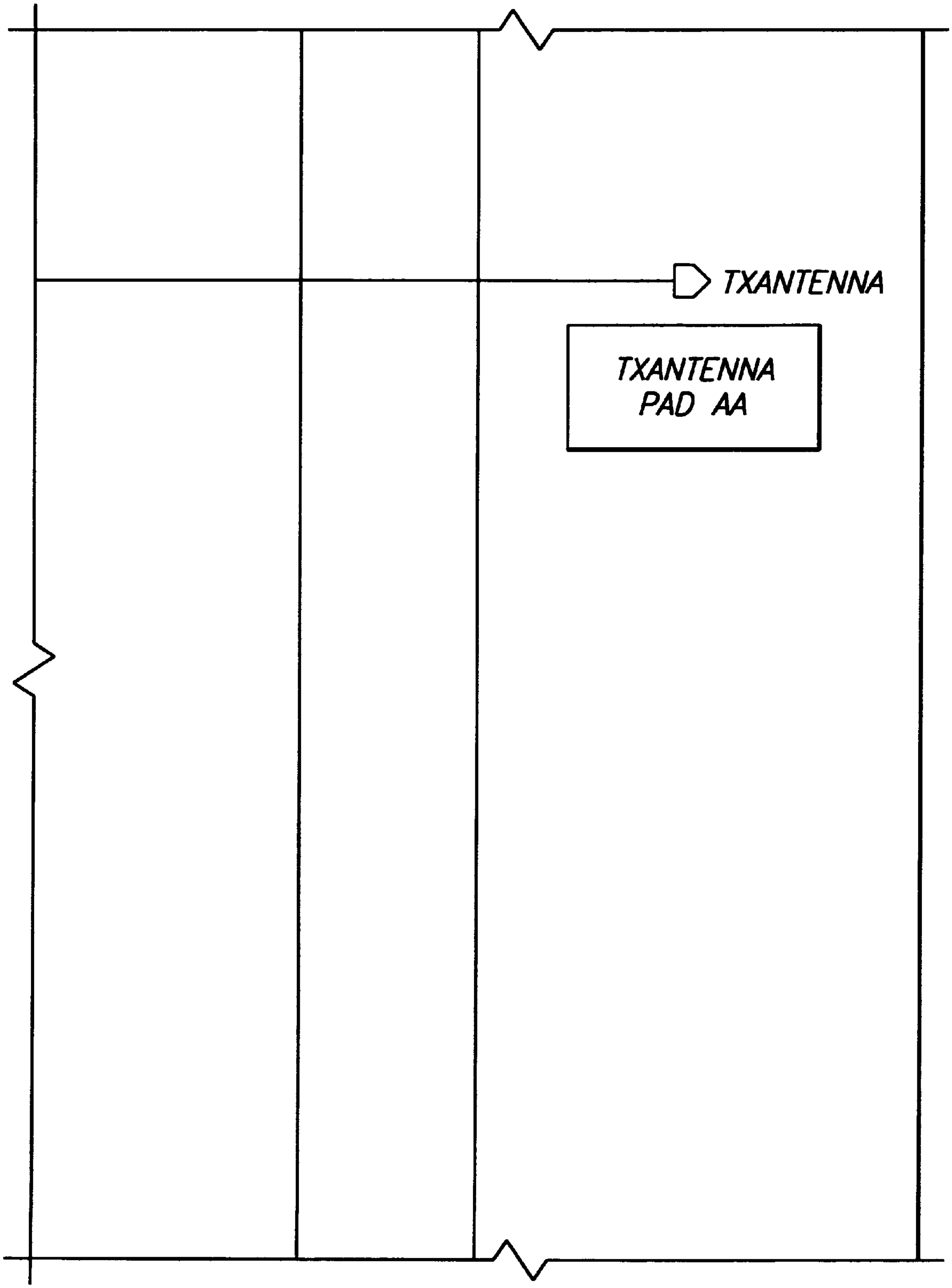
Figure 19D:
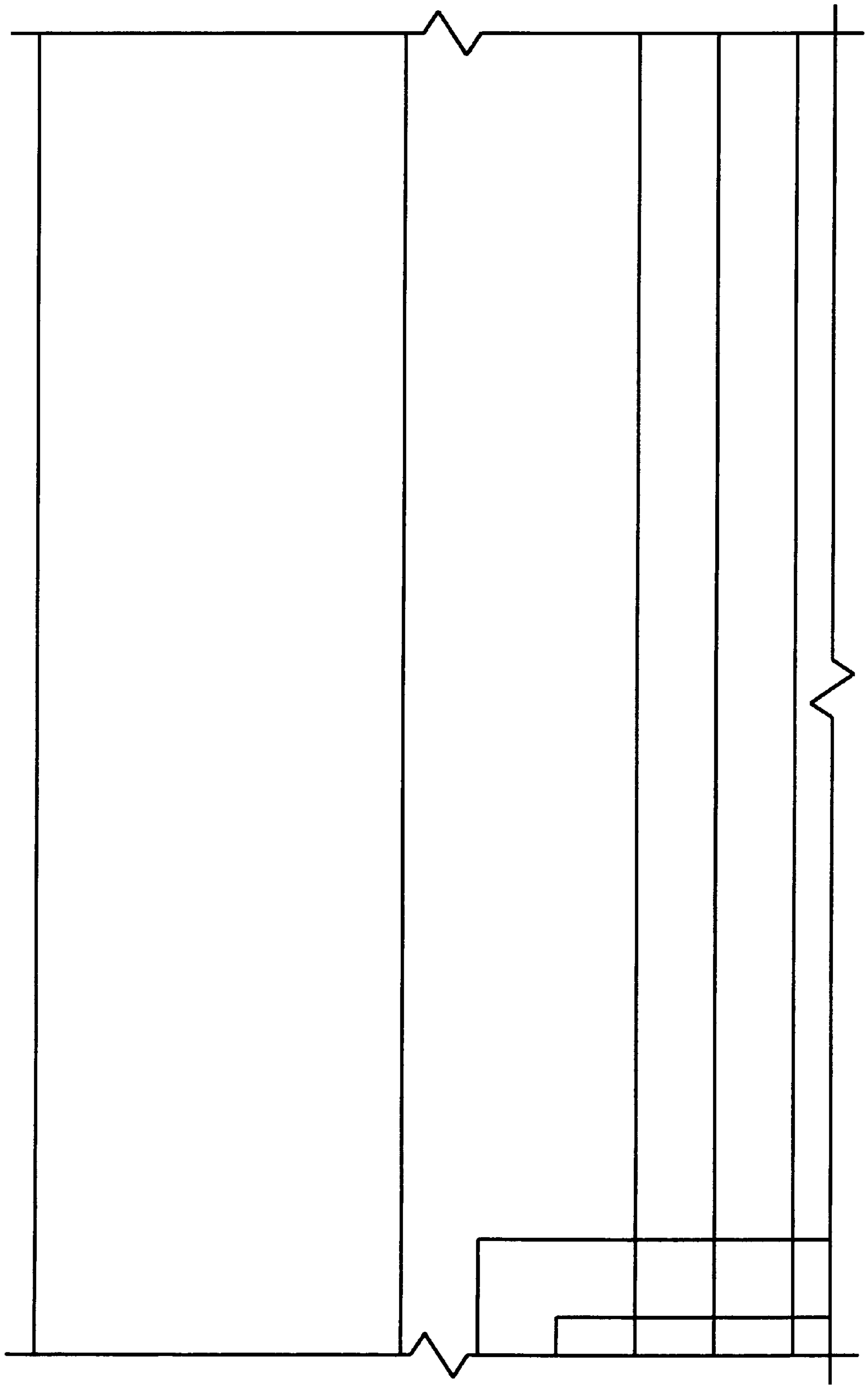
Figure 19D:
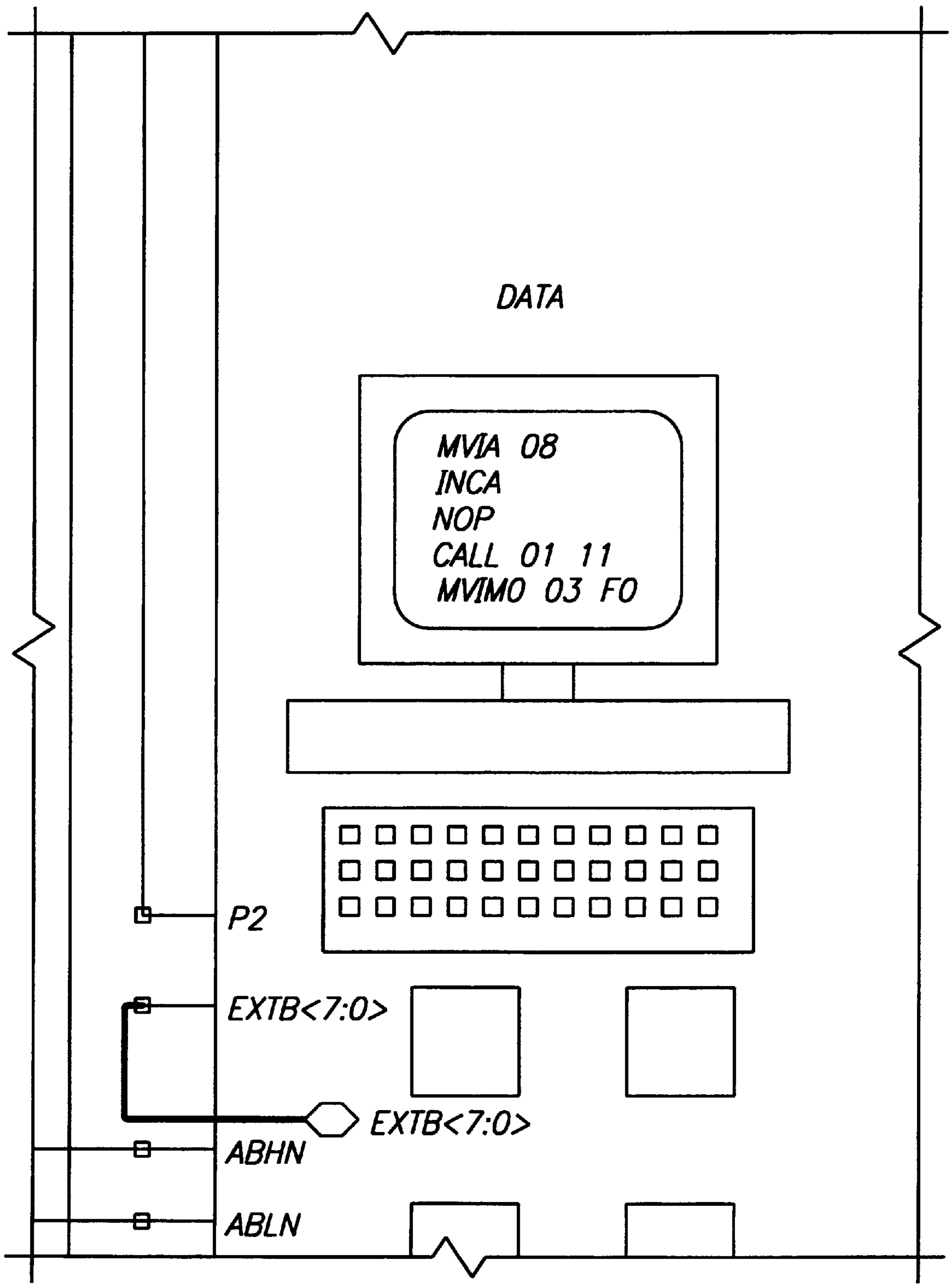
Figure 19D:
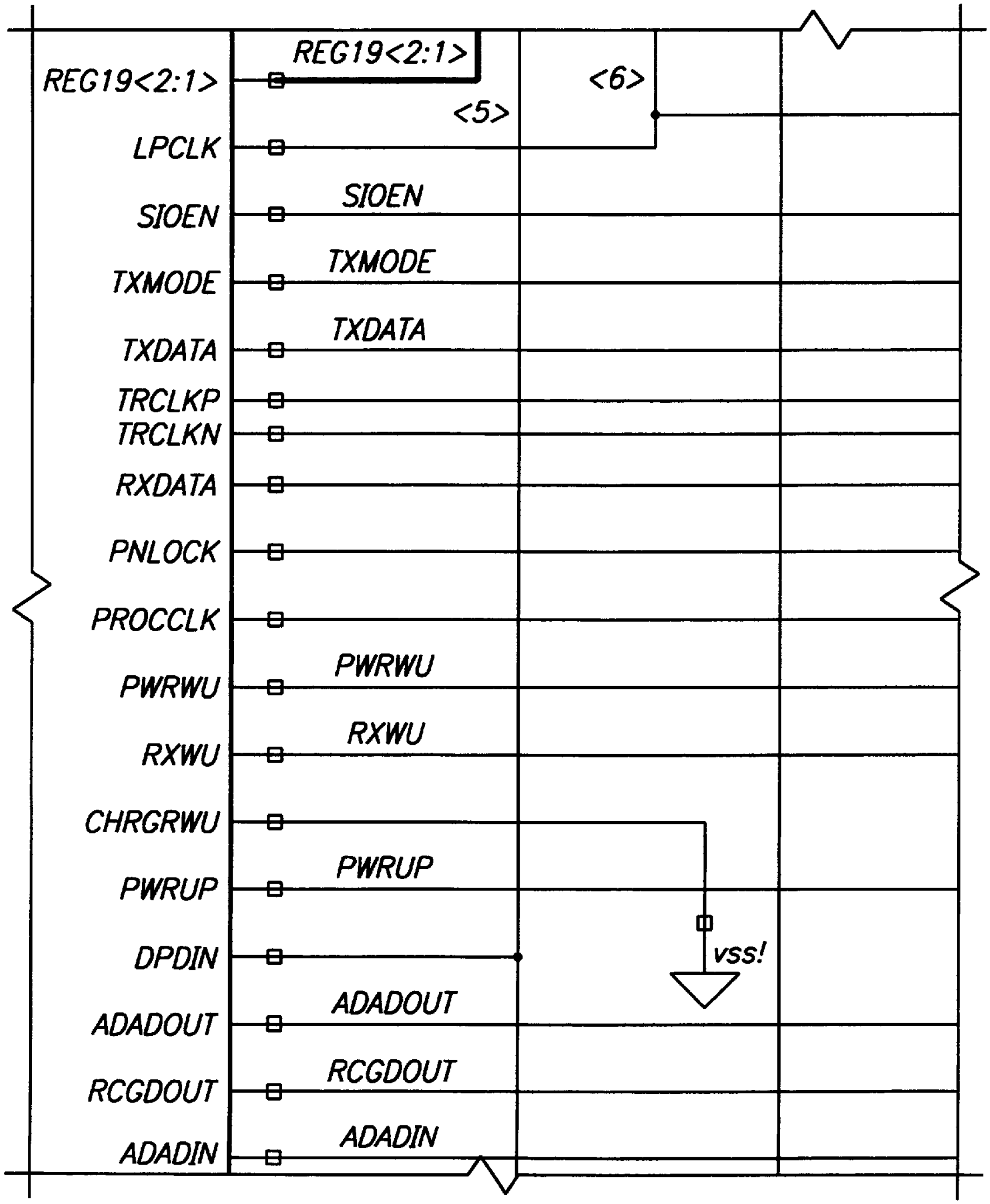
Figure 19D:
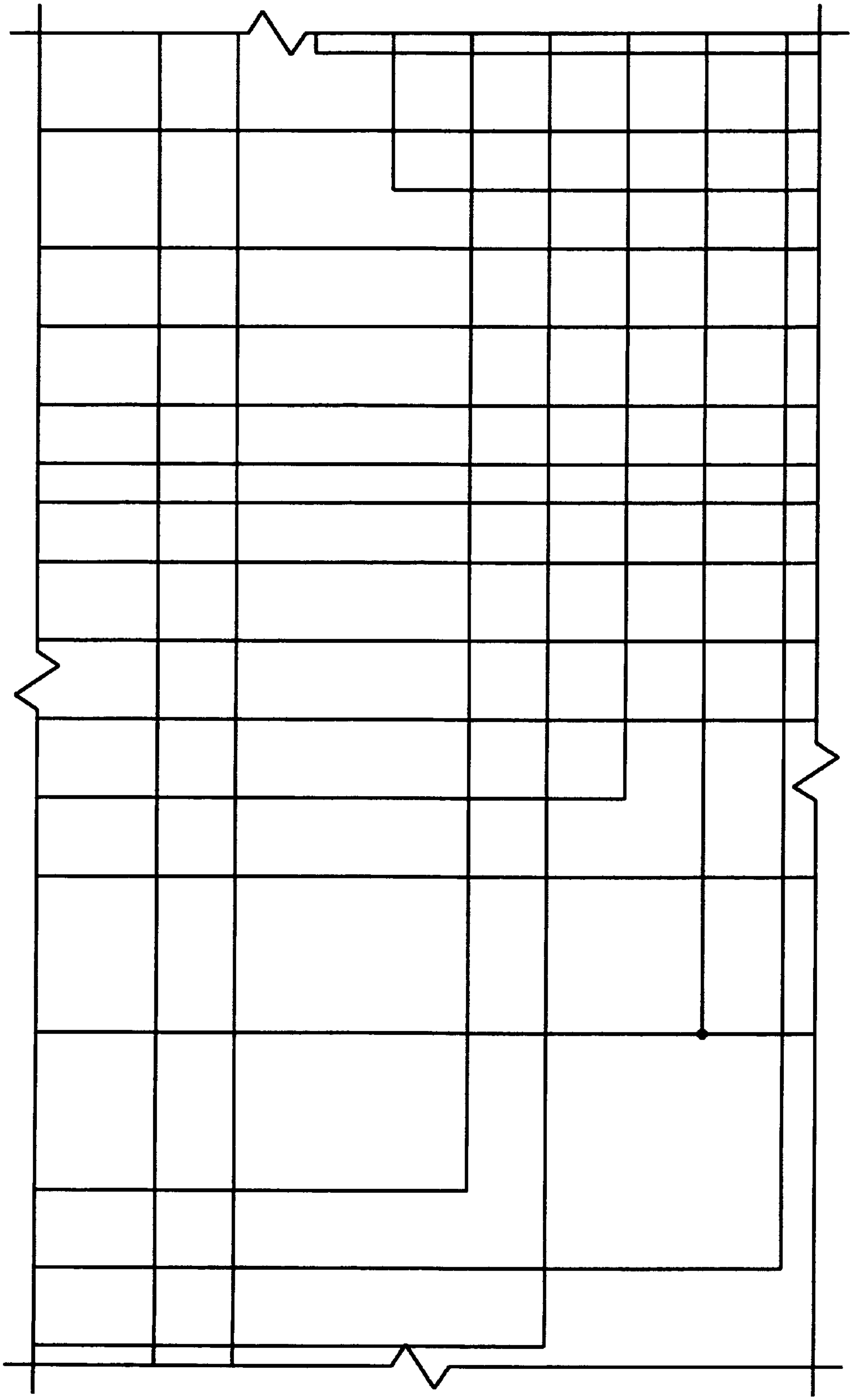
Figure 19D:
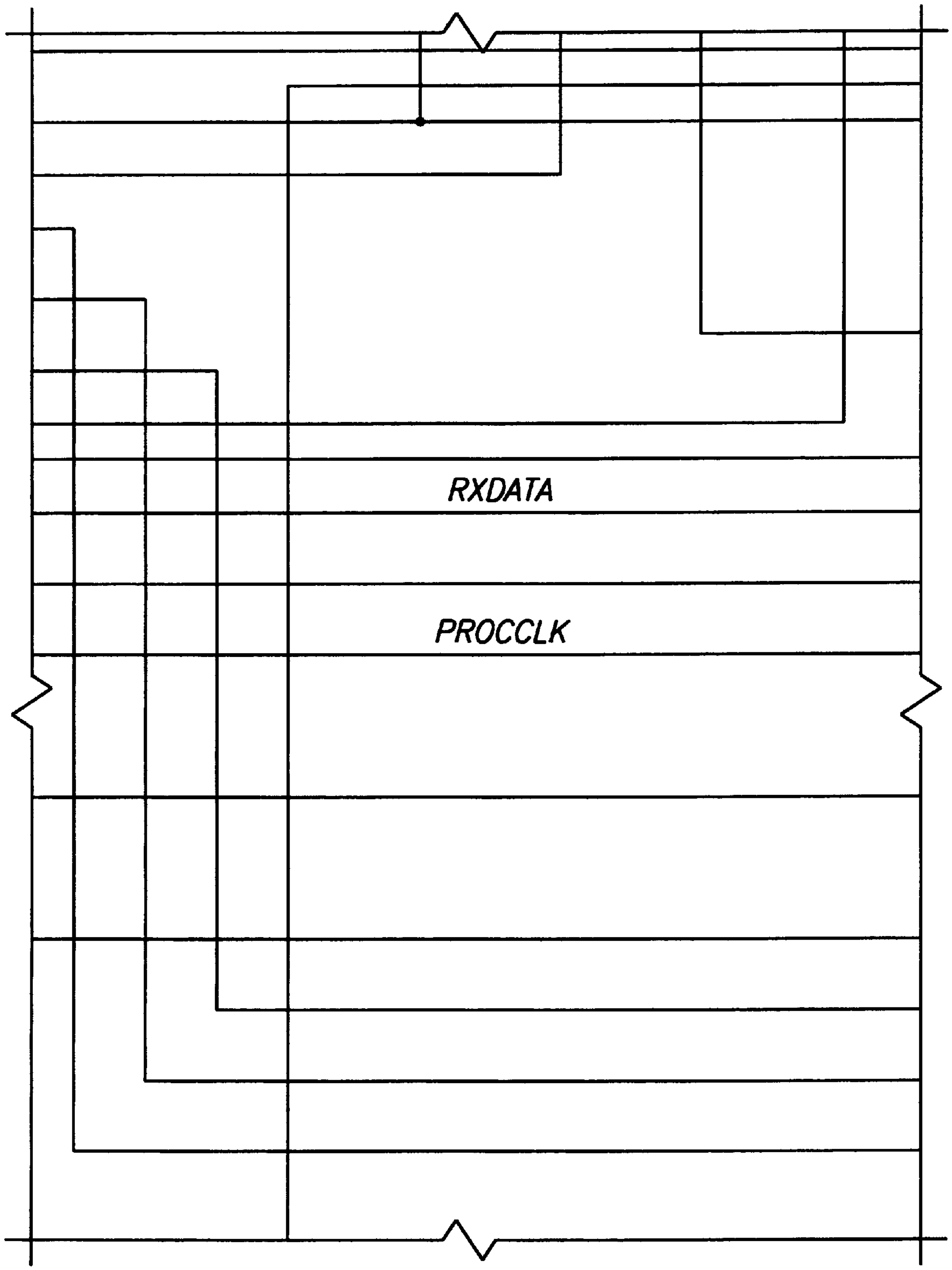
Figure 19D:
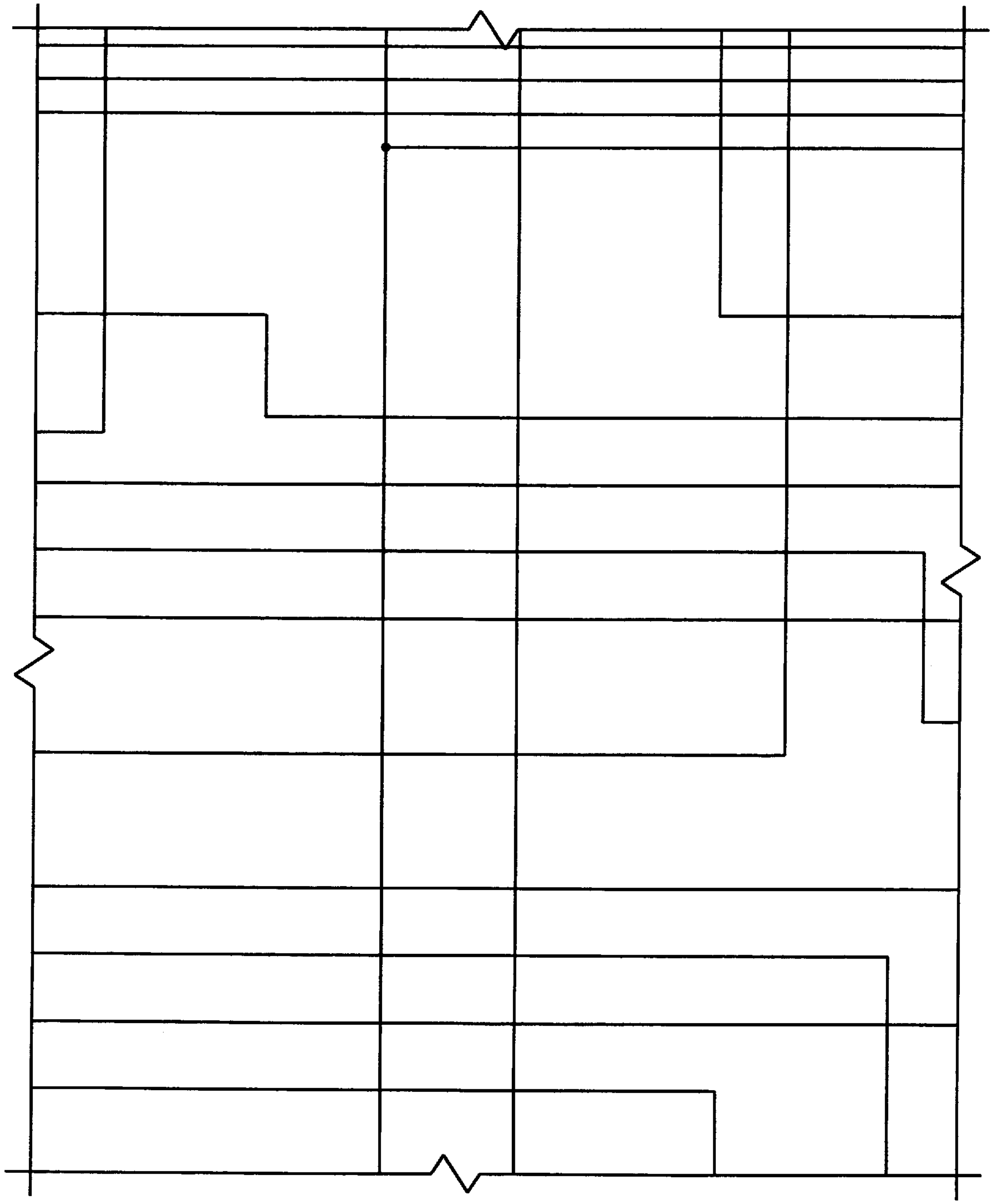
Figure 19D:
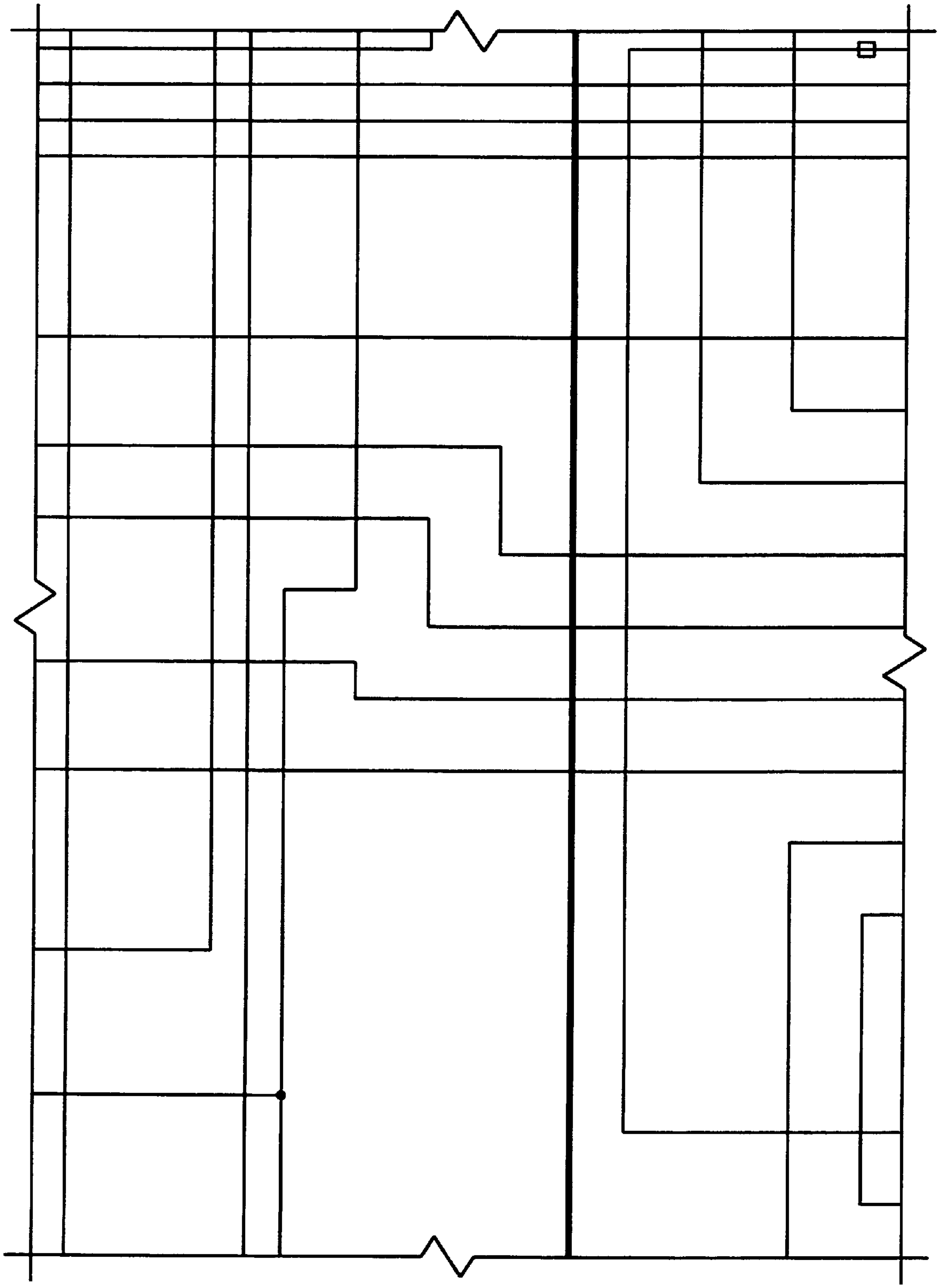
Figure 19D:
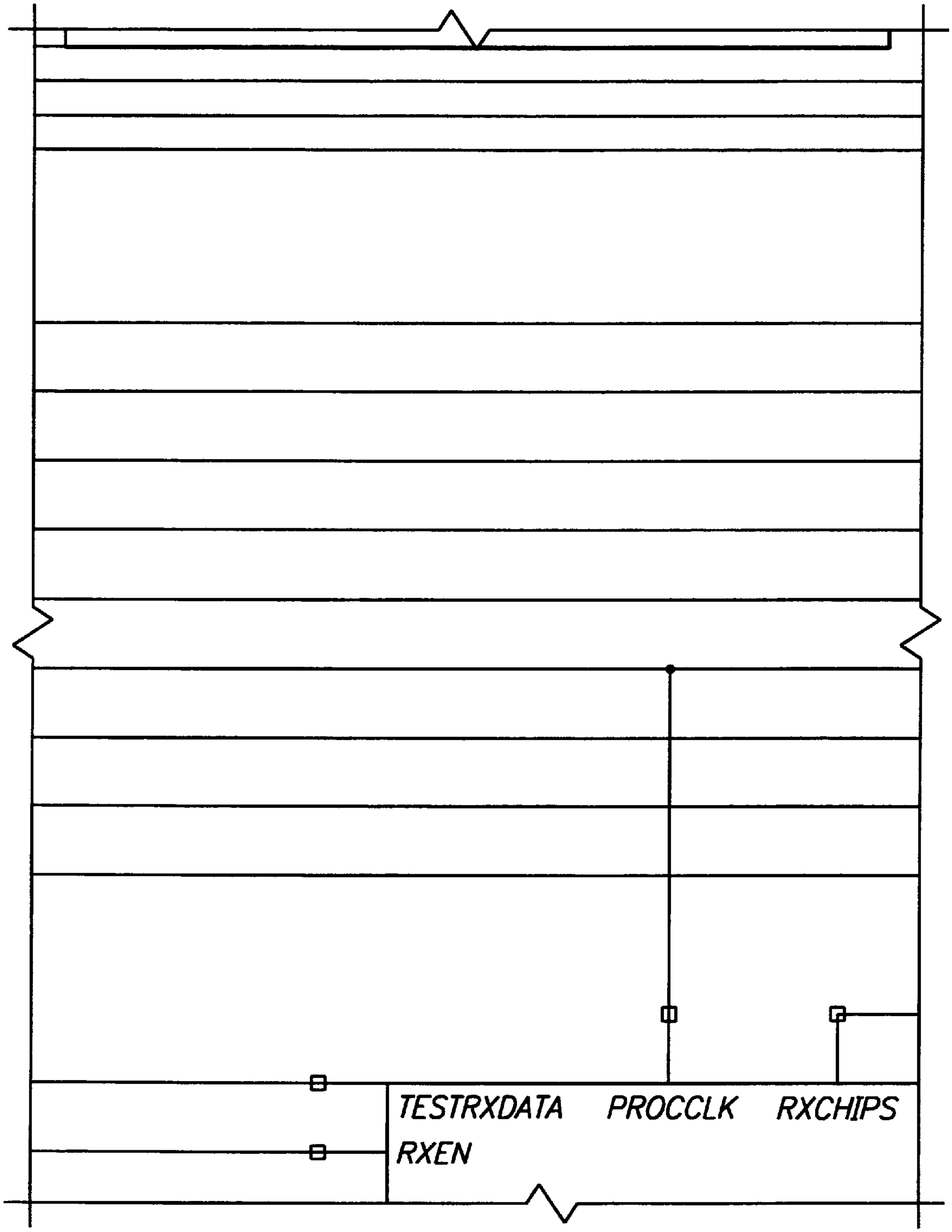
Figure 19D:
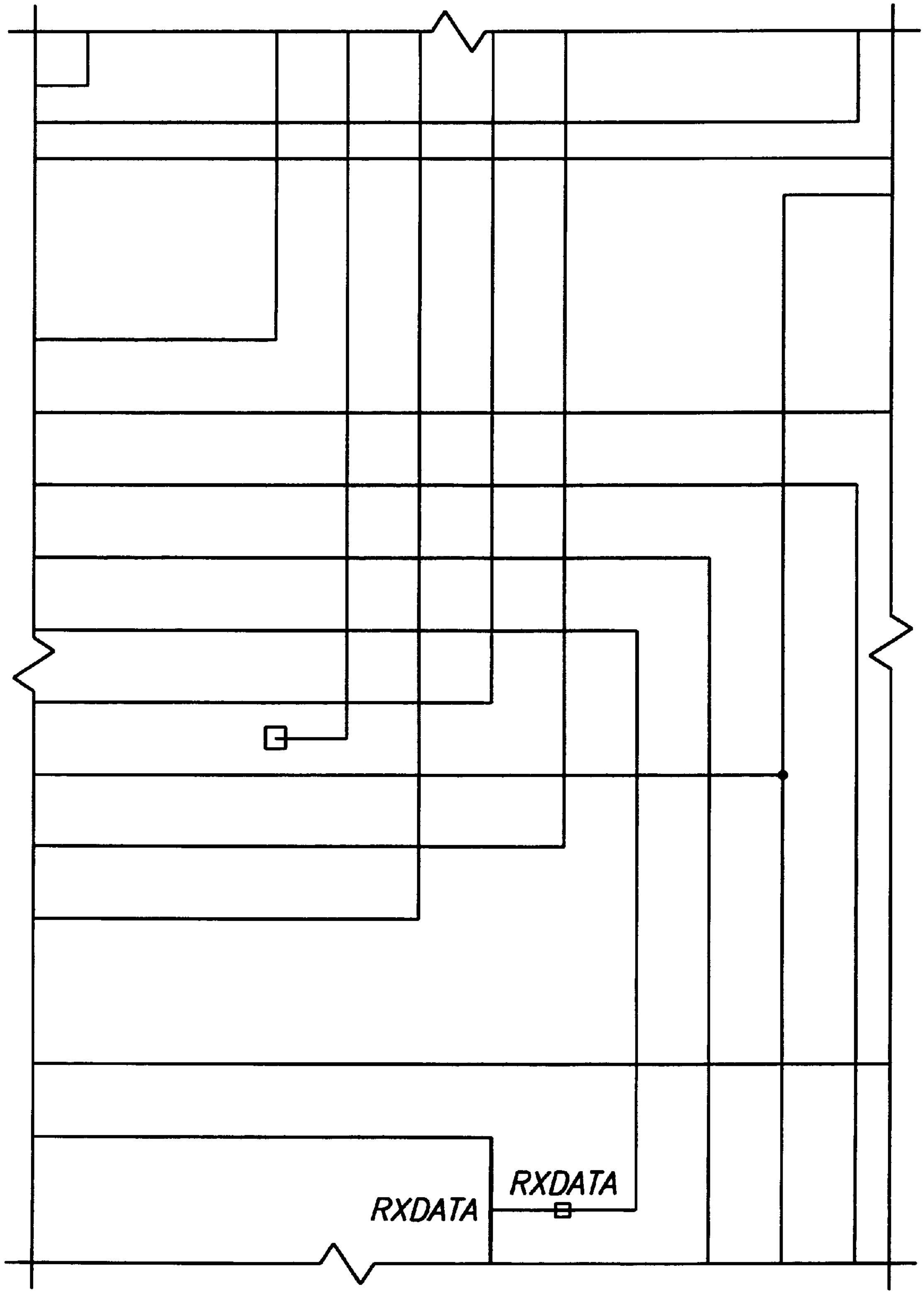
Figure 19D:
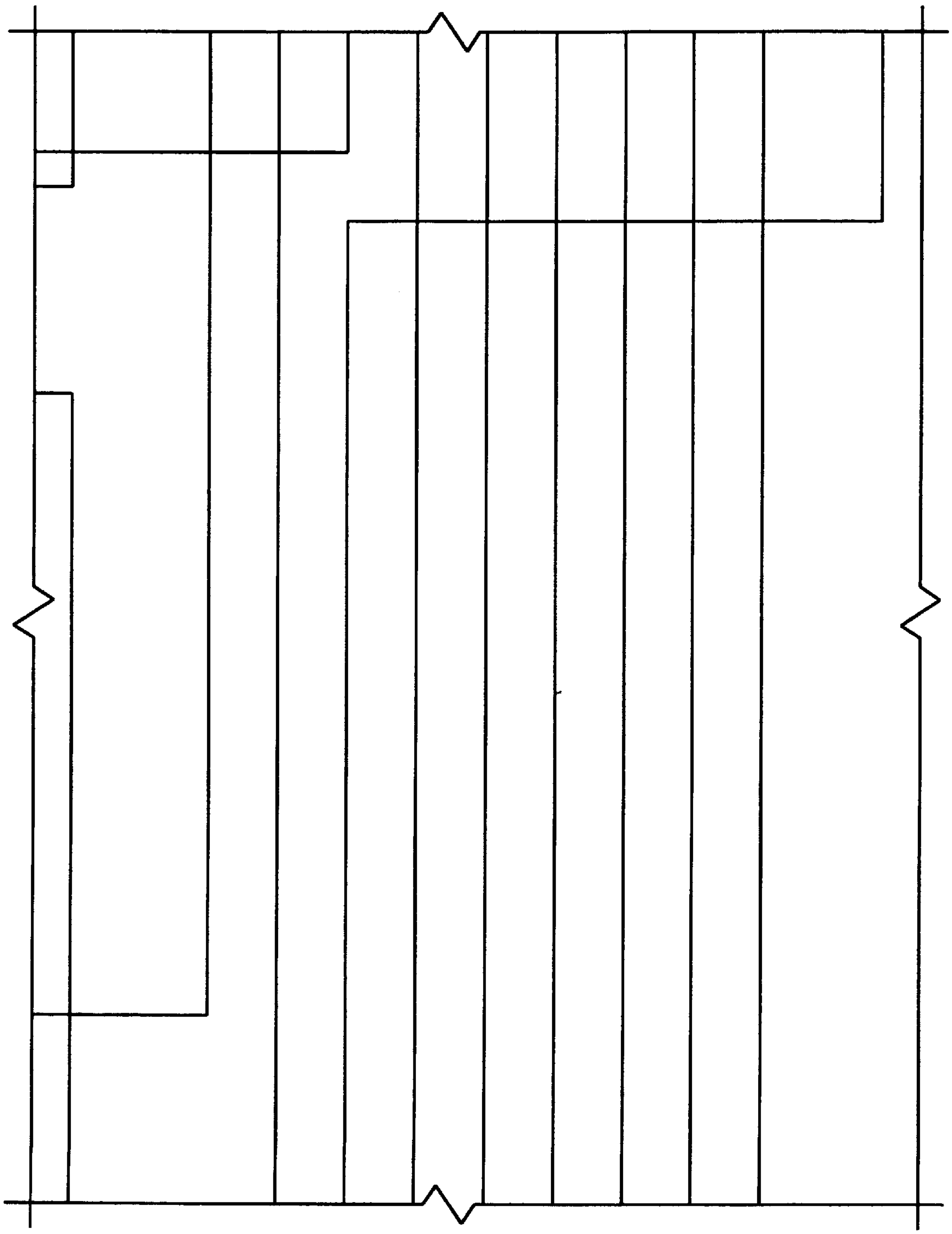
Figure 19D:
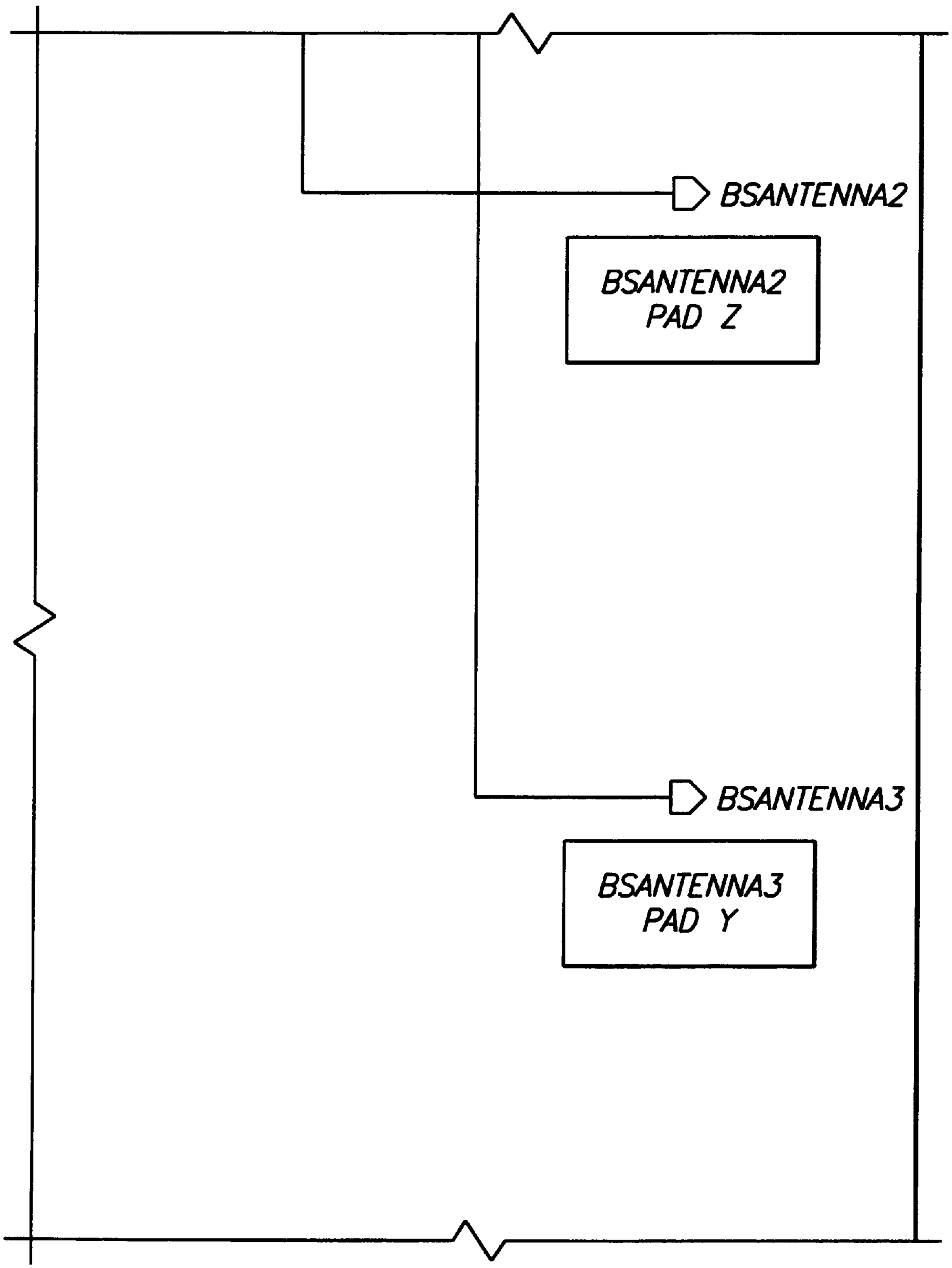
Figure 19E:
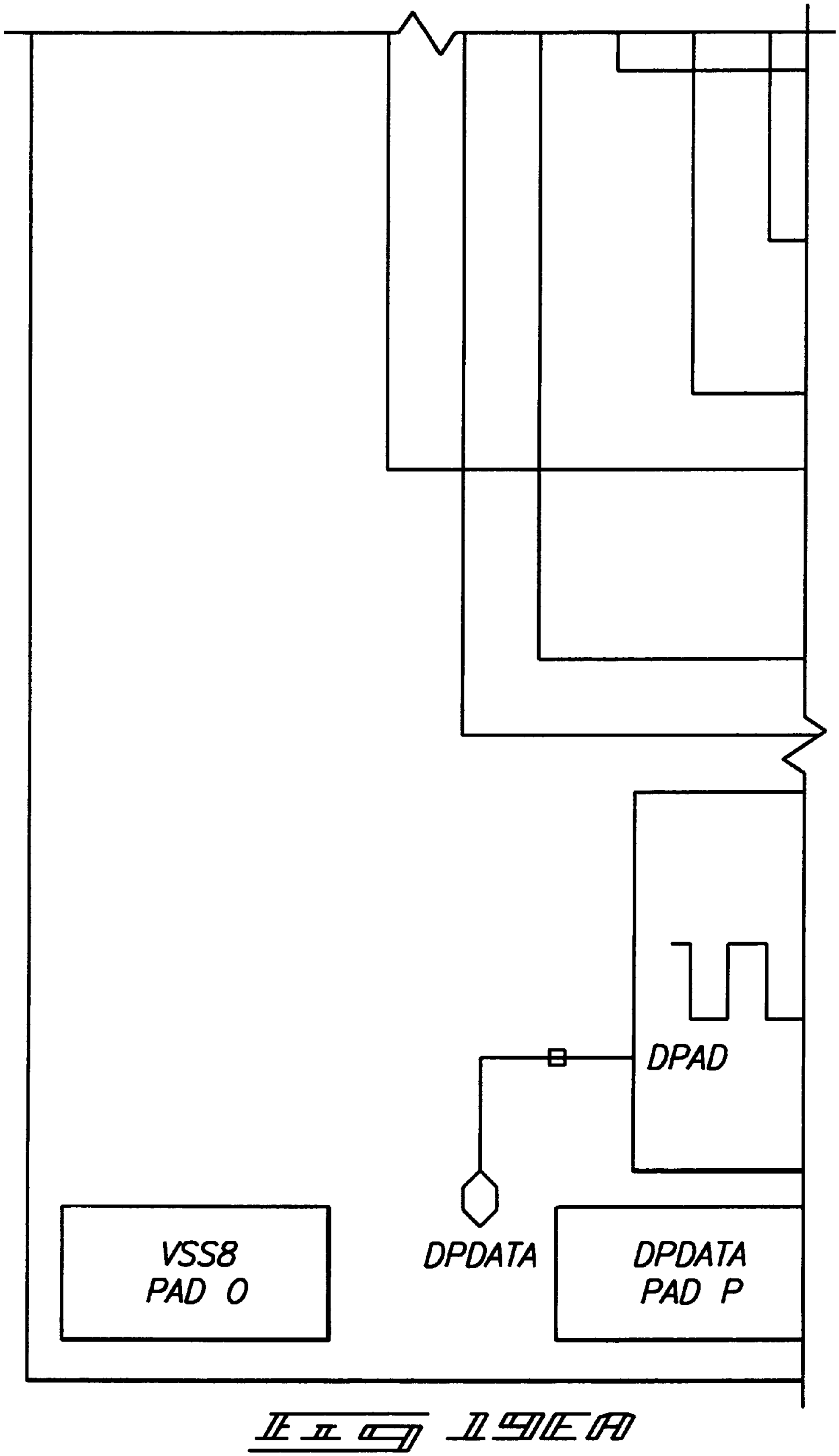
Figure 19E:
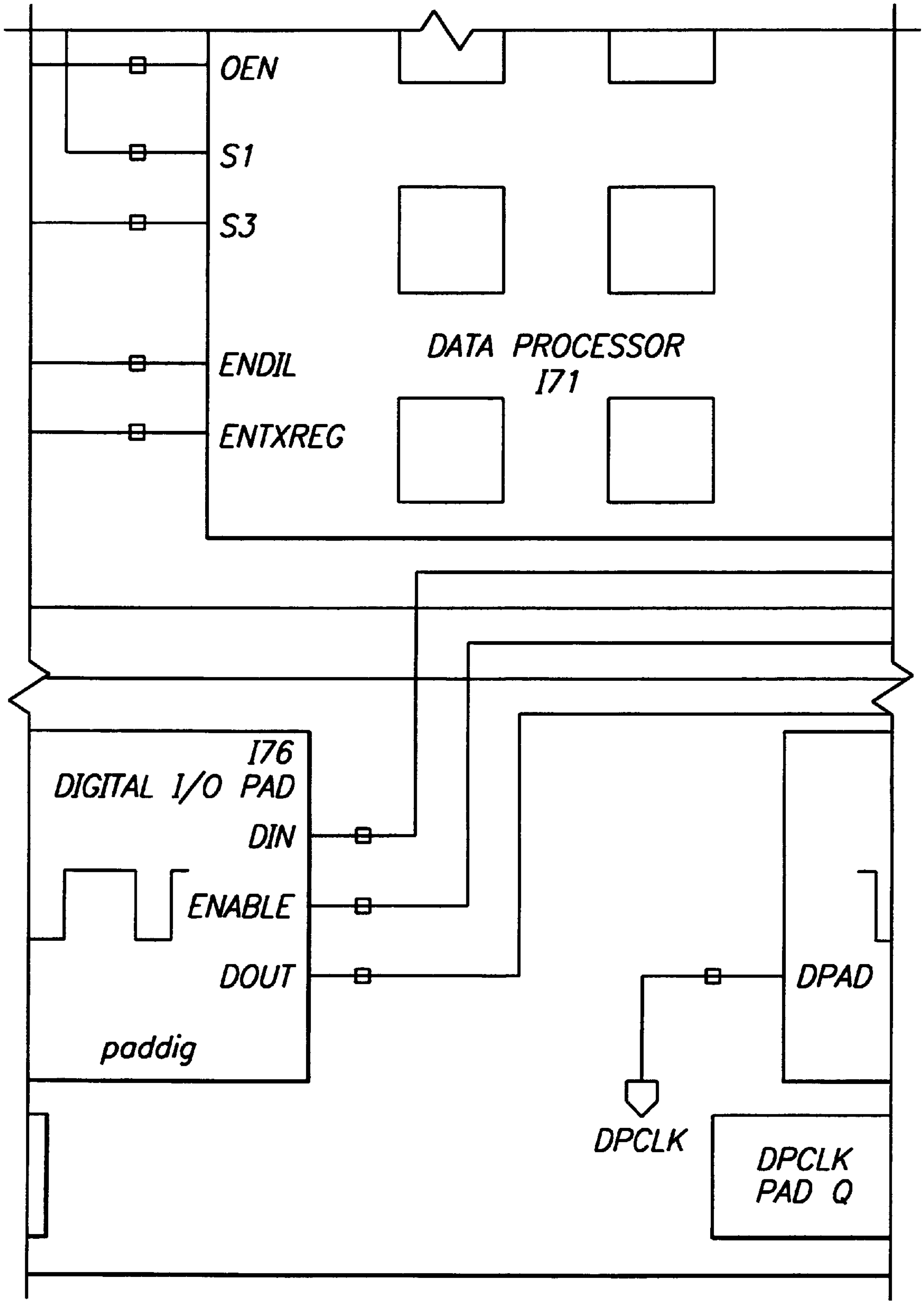
Figure 19E:
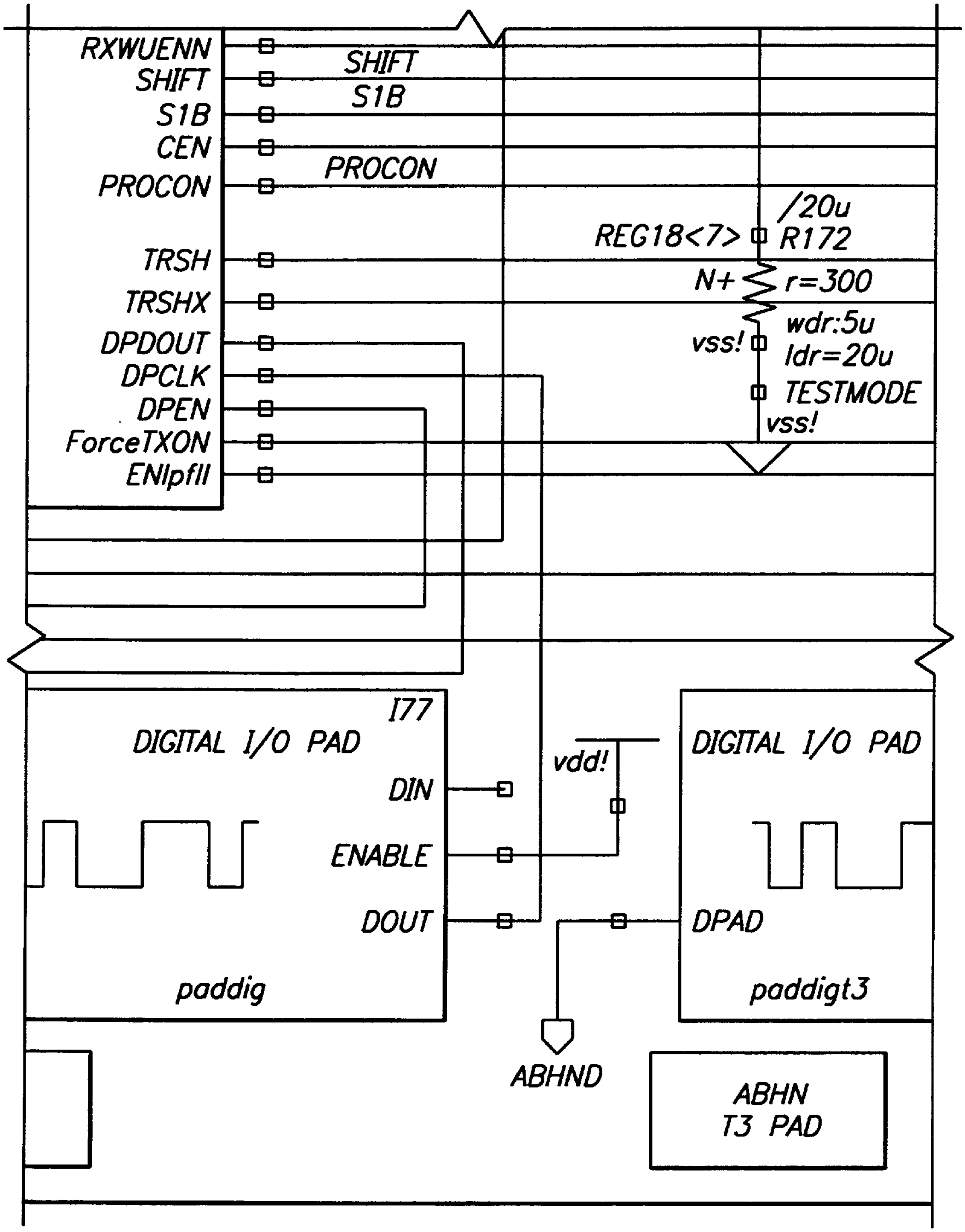
Figure 19E:
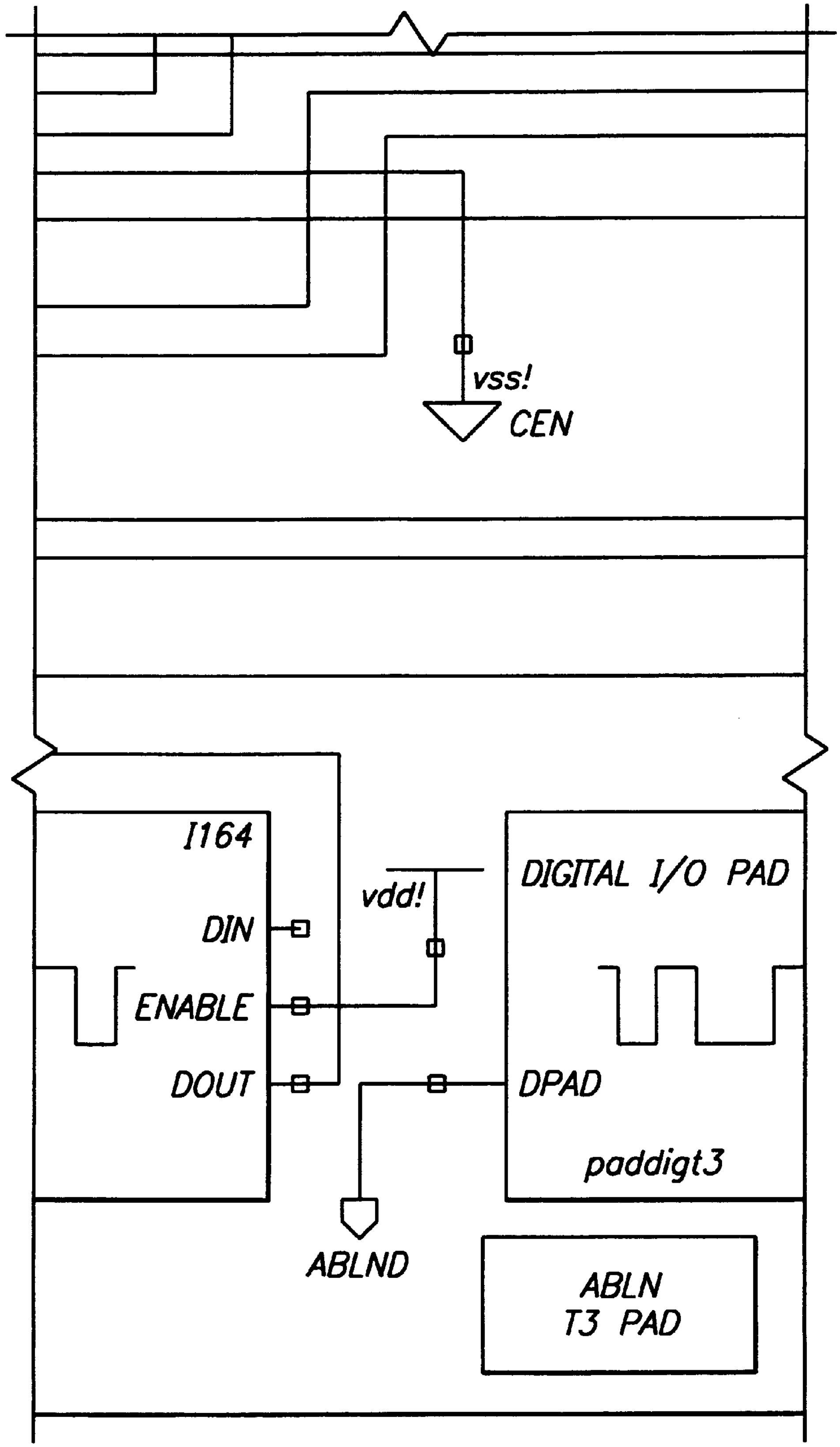
Figure 19E:
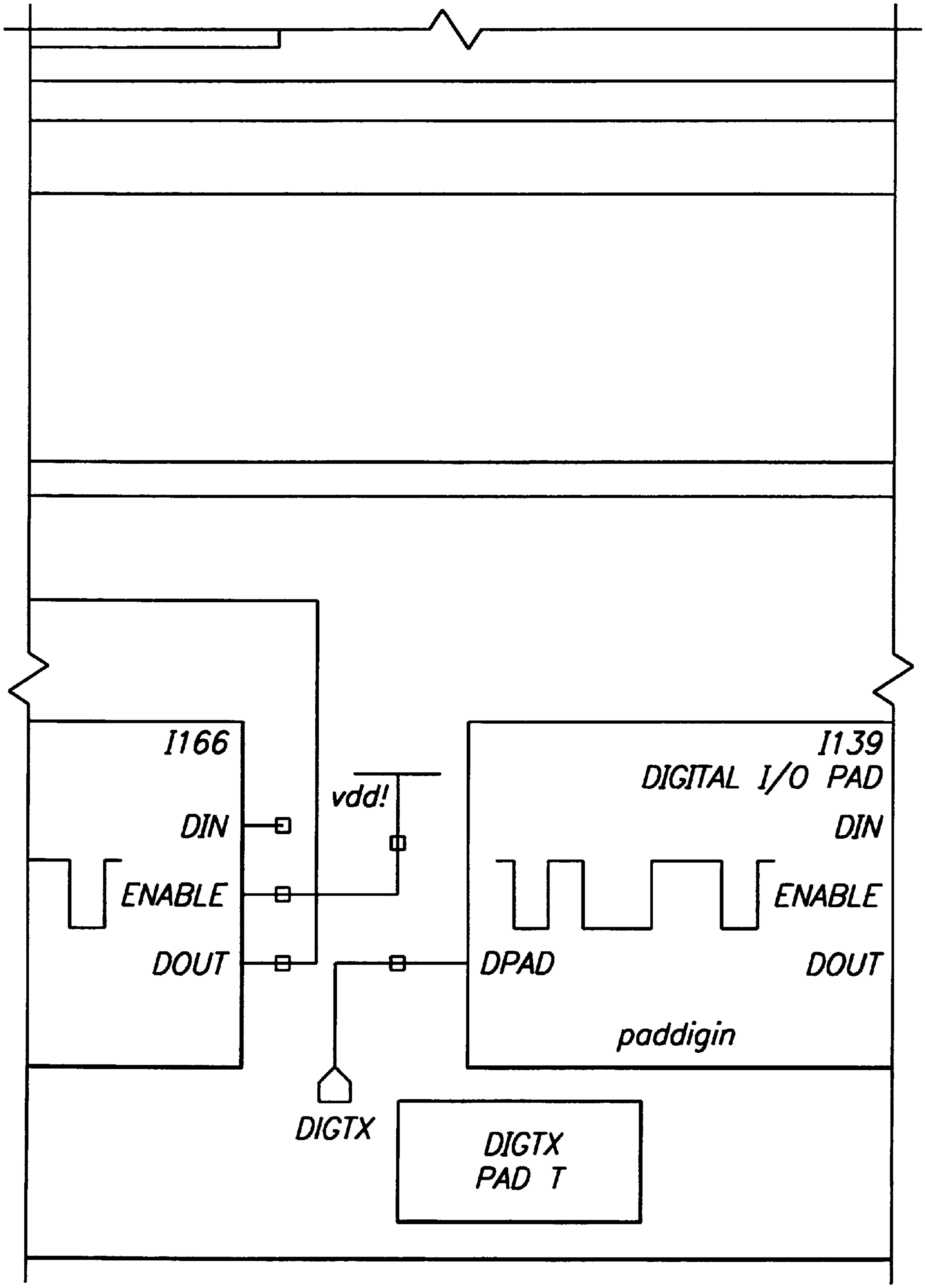
Figure 19E:
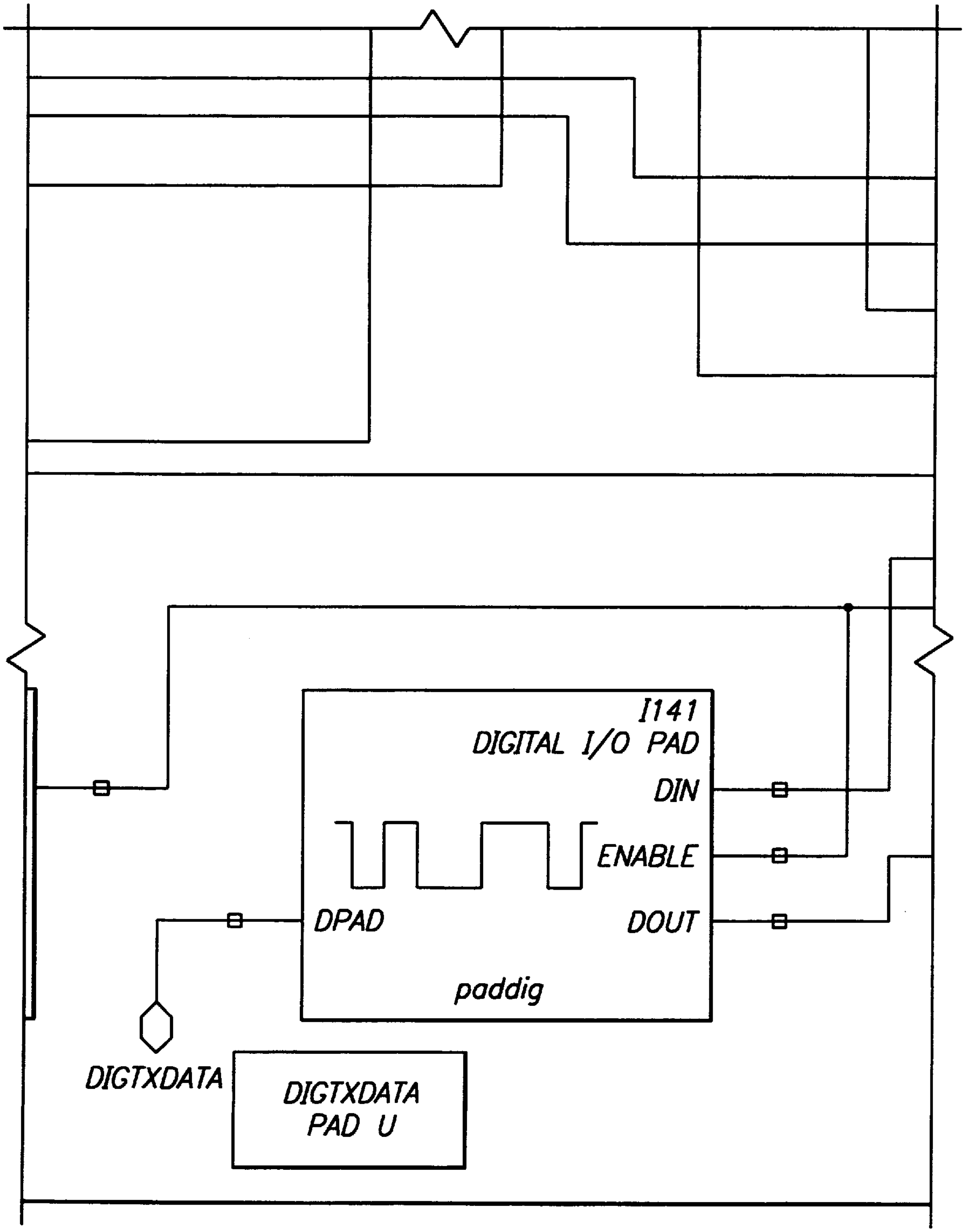
Figure 19E:
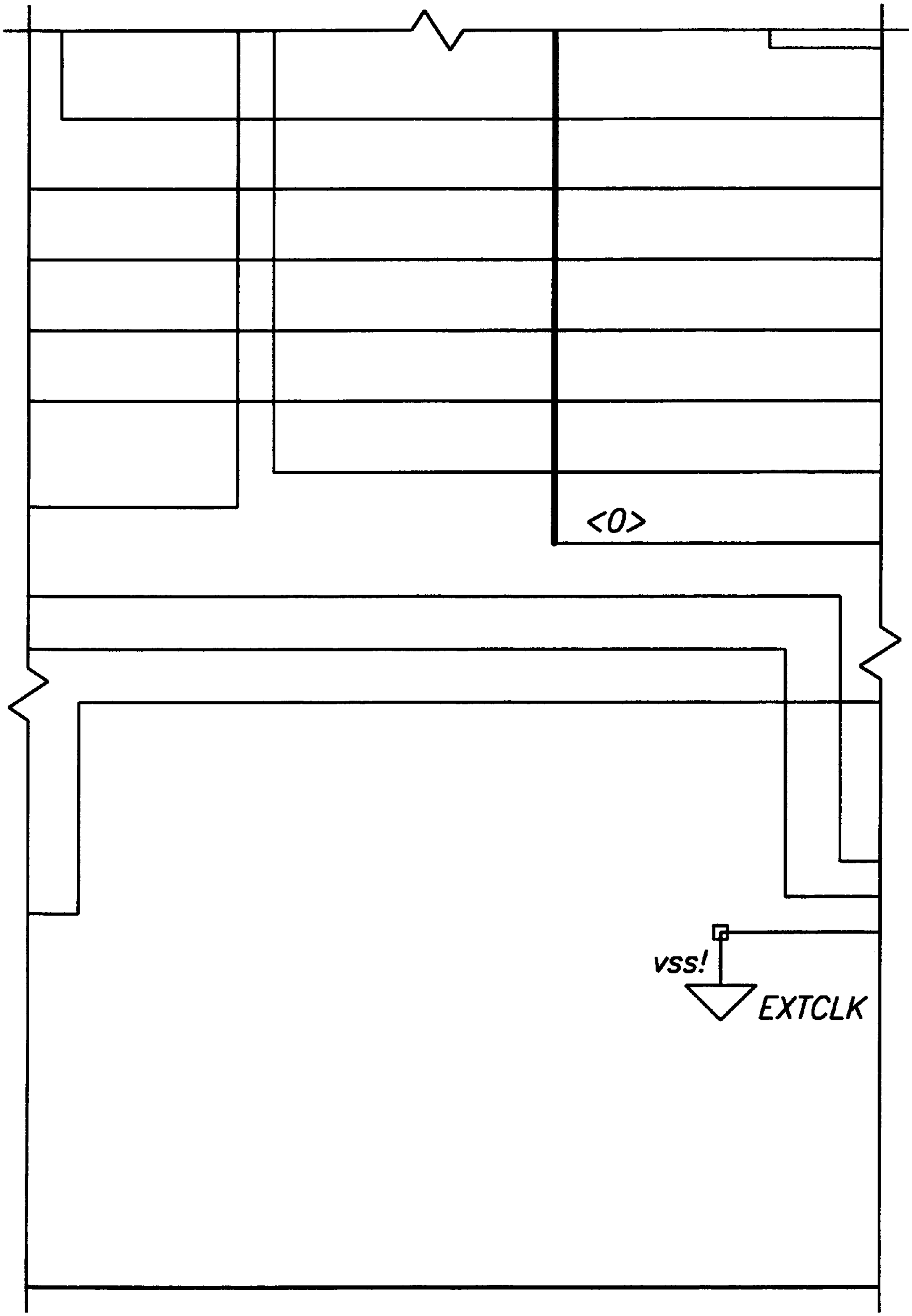
Figure 19E:
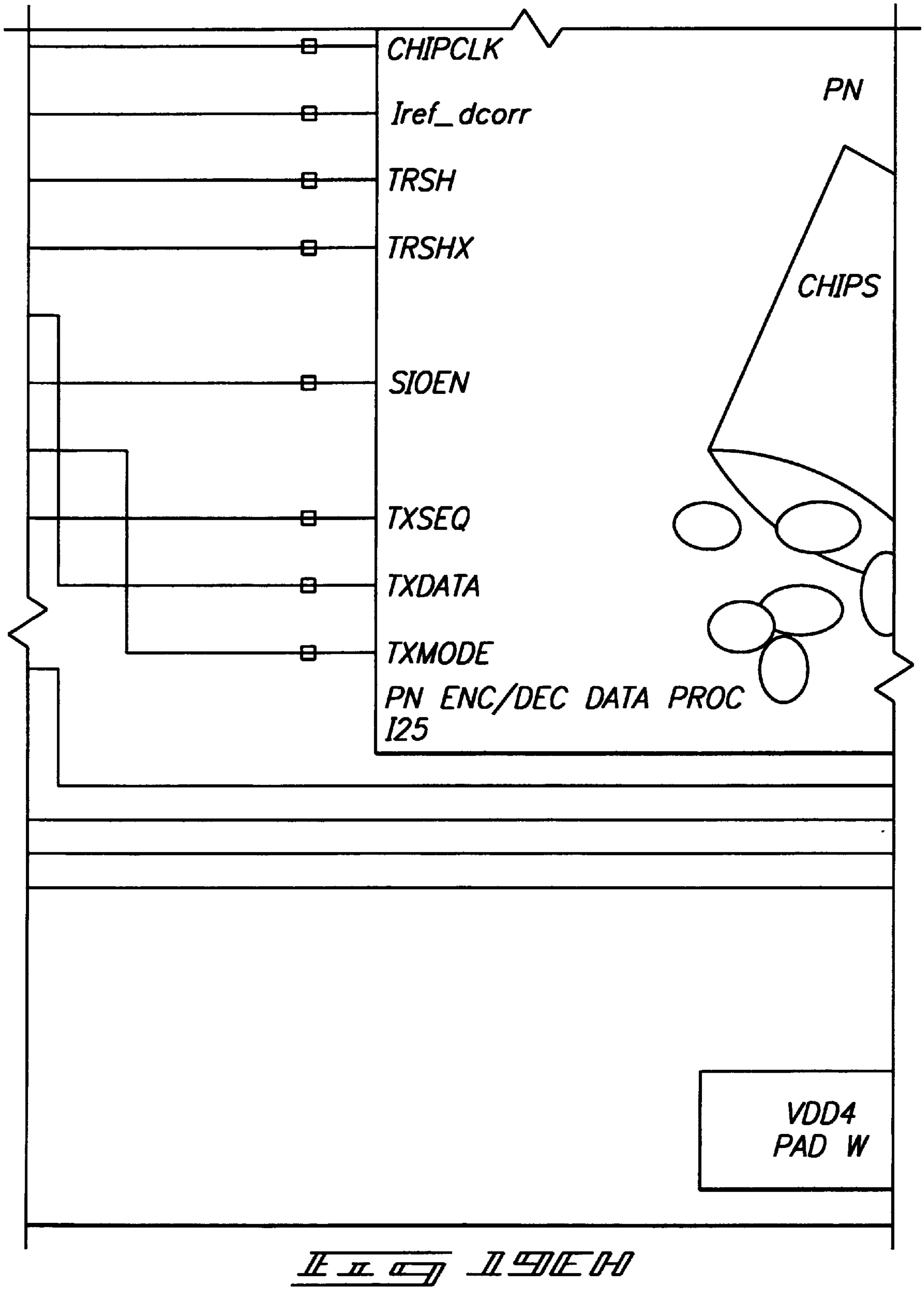
Figure 19E:
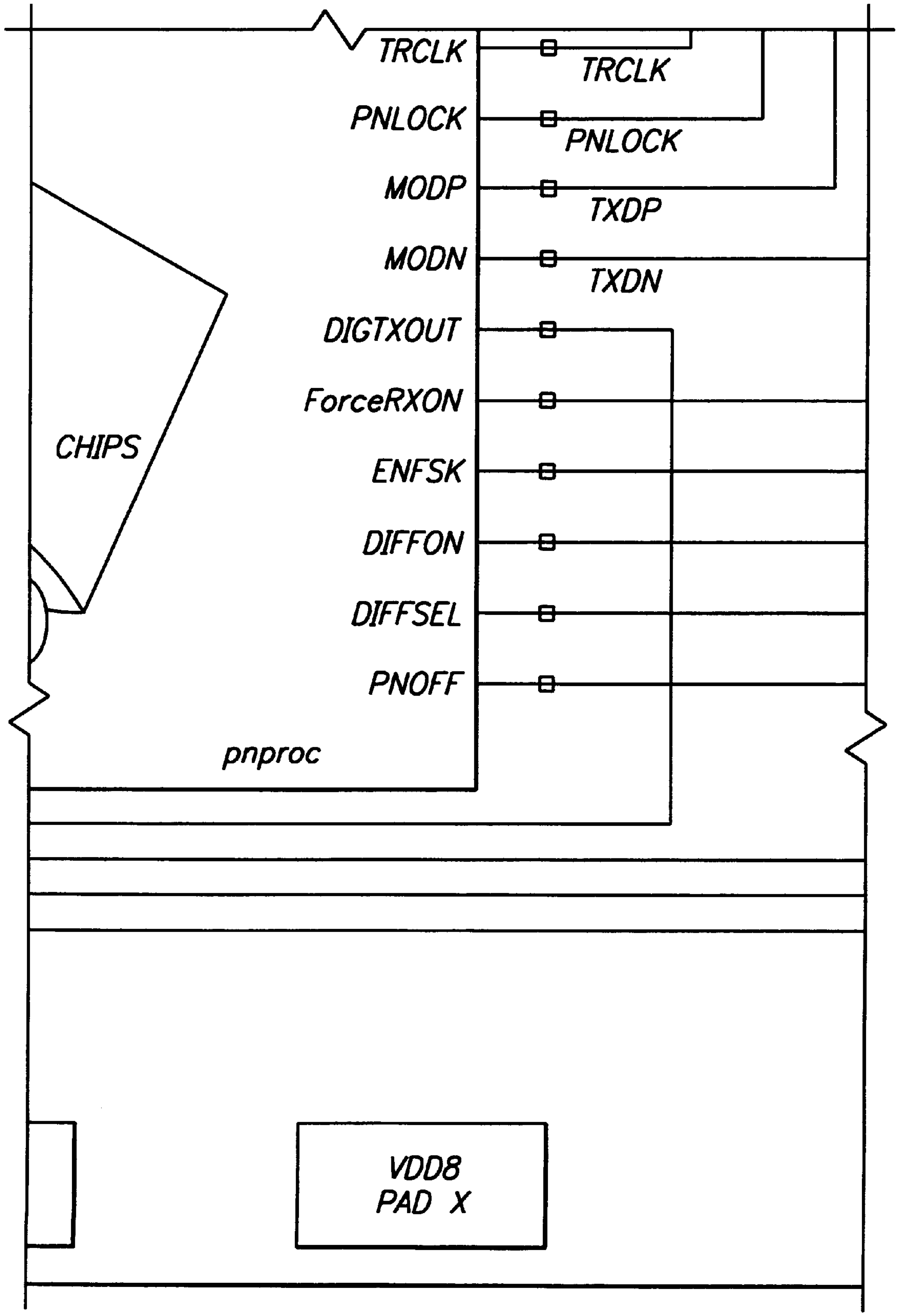
Figure 19E:
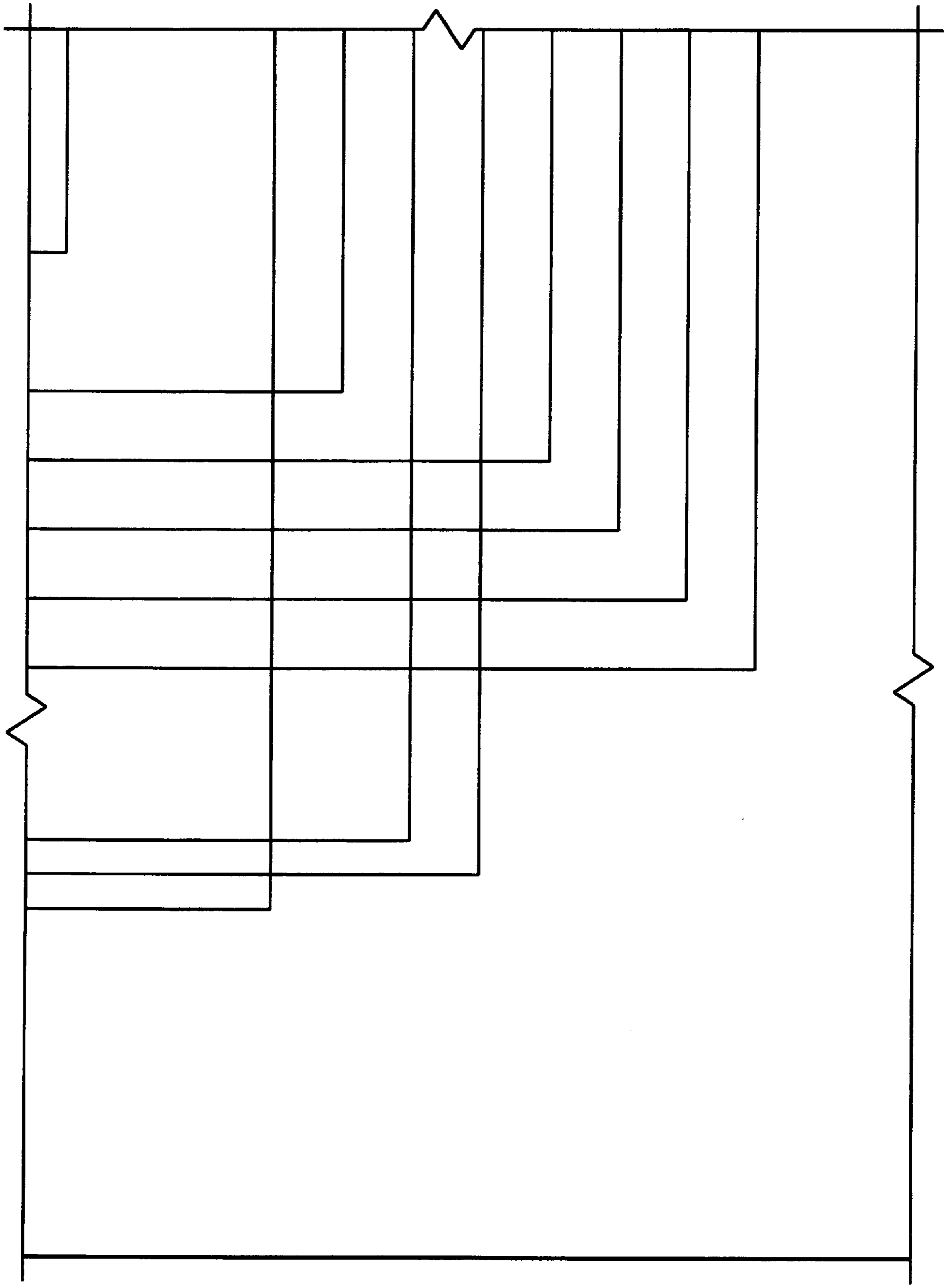
Figure 19E:
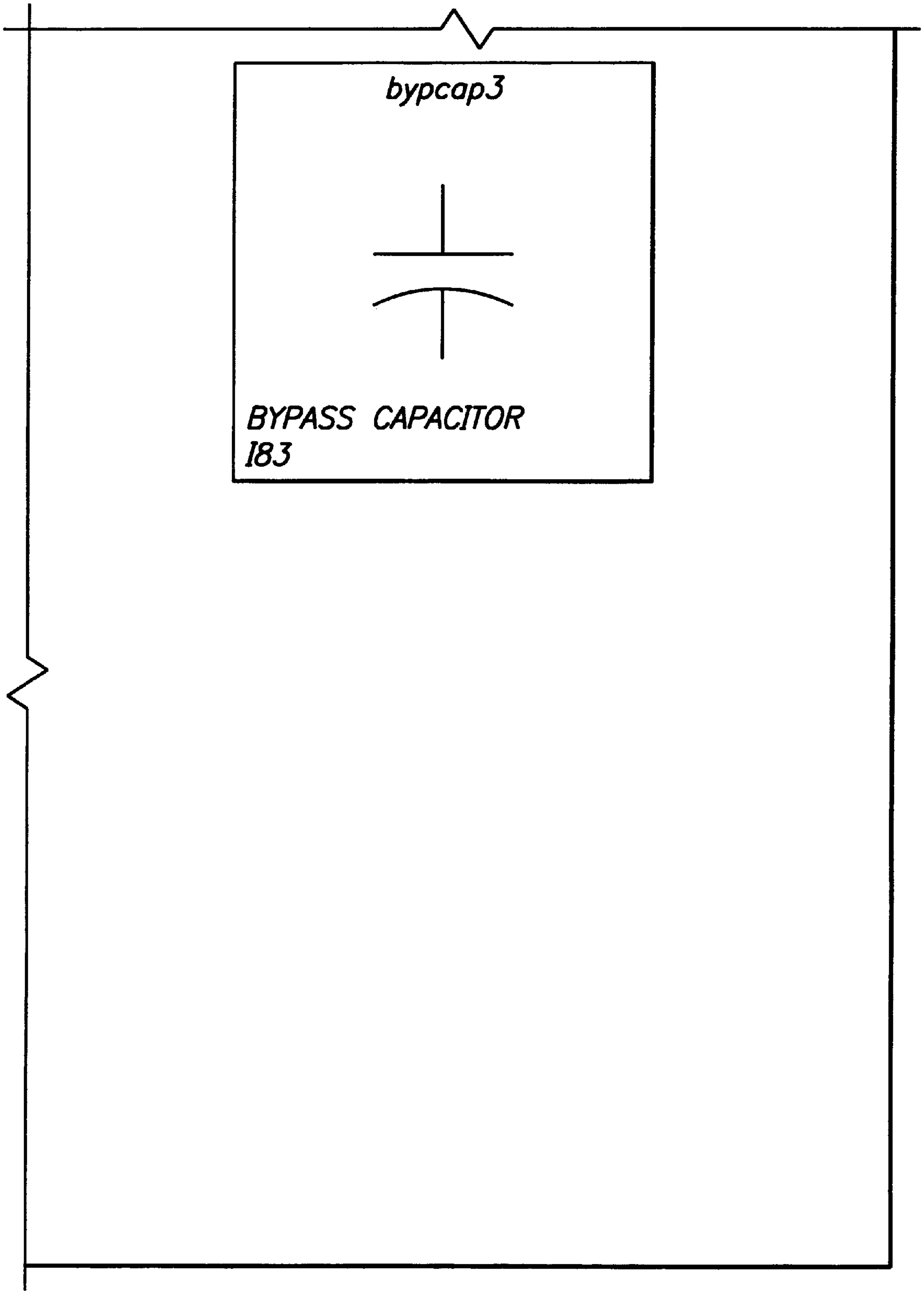

FIG. 19 is a graph illustrating how FIGS. 19AA–EK are to be assembled. After such assembly, FIGS. 19AA–EK provide a circuit drawing of a monolithic semiconductor integrated circuit "LO3BT3F" in accordance with an alternative embodiment of the invention. The integrated circuit of FIGS. 19AA–EK is similar to the integrated circuit shown in FIGS. 6AA–EK, like component names indicating like components, except that the integrated circuit of FIGS. 19AA–EK has no ROM, and is adapted to be connected to external ROM "extrom". The embodiment of FIGS. 19AA–EK is particularly useful for test purposes.

Figure 20A:
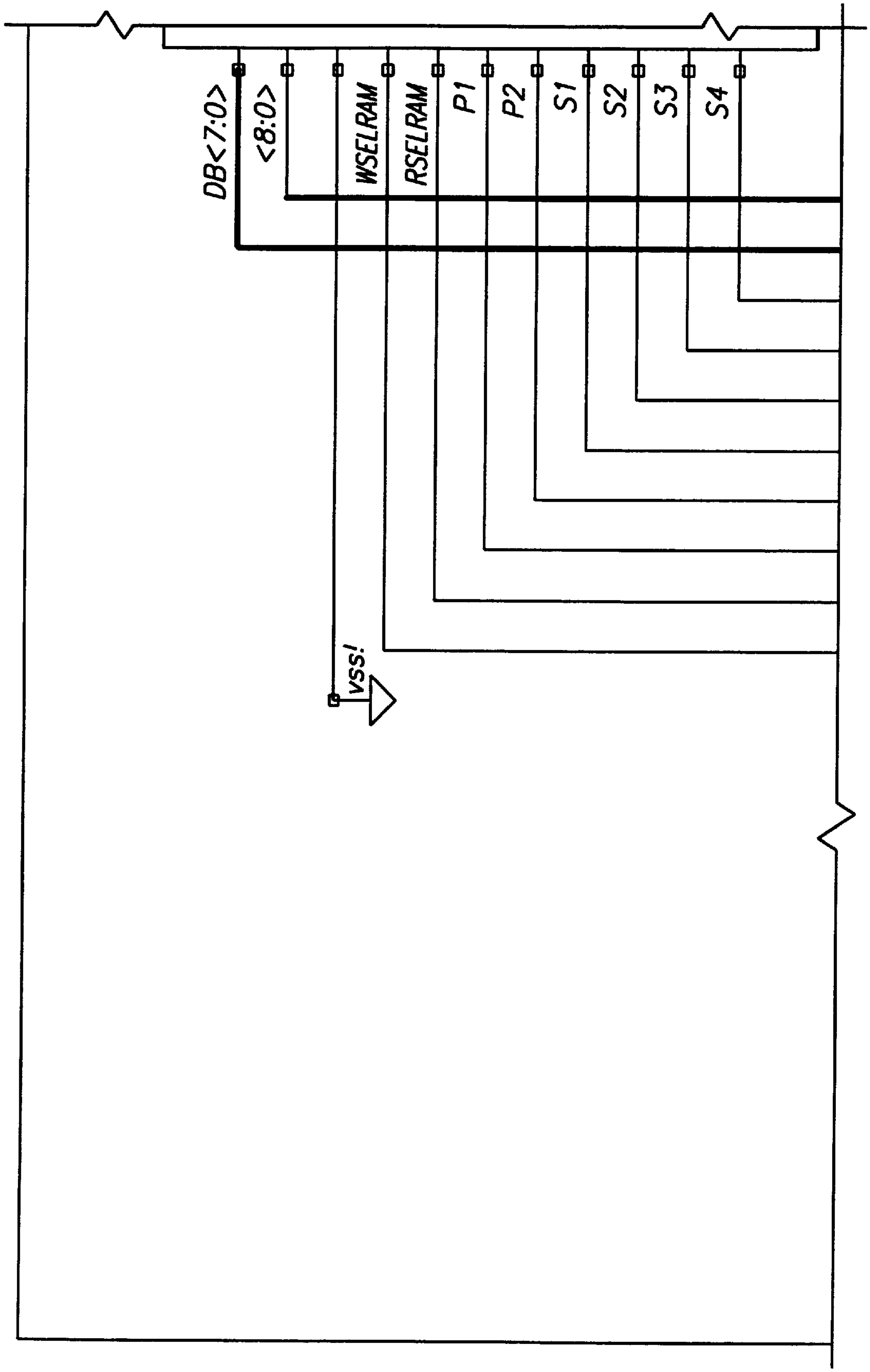
Figure 20A:
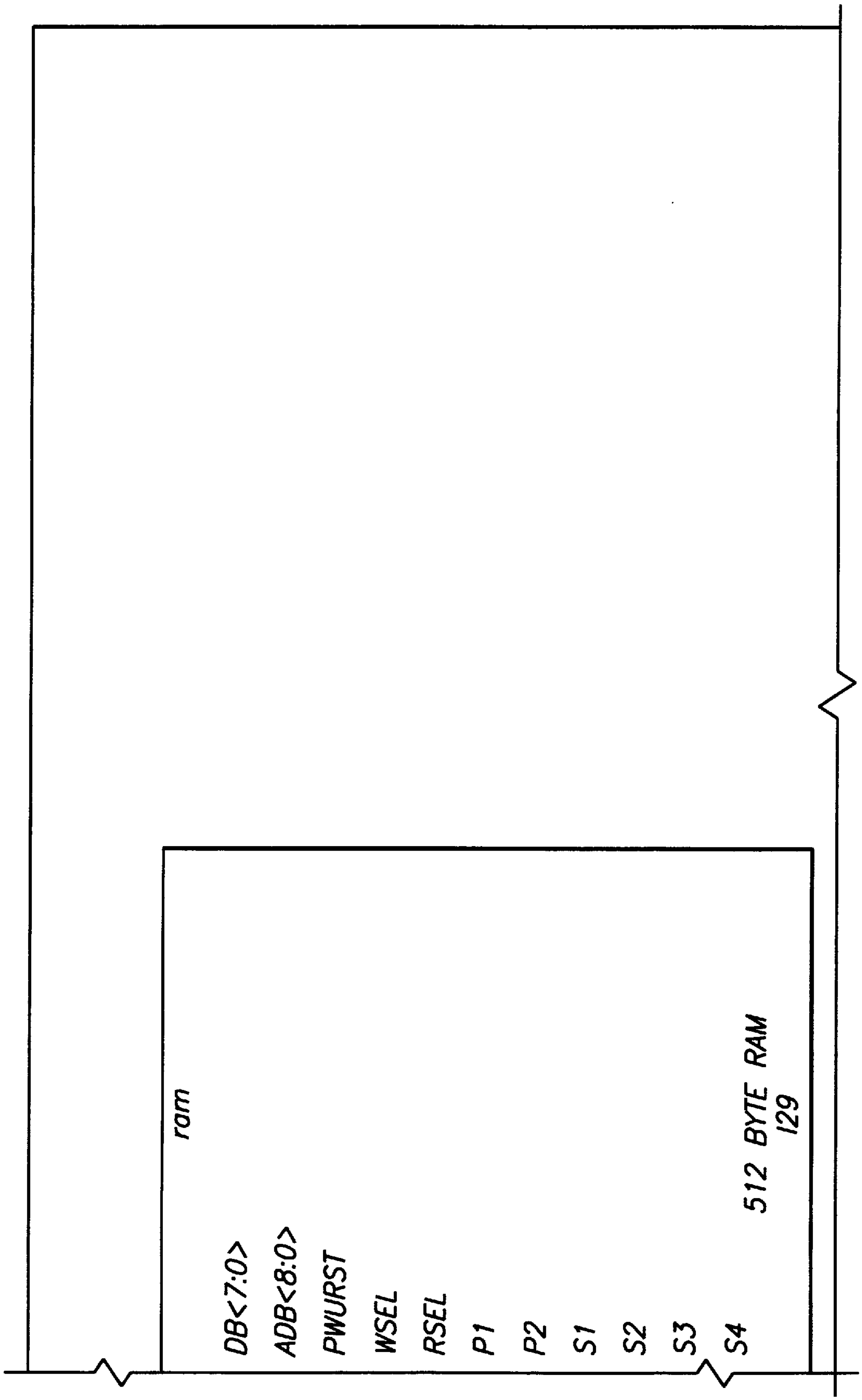
Figure 208A:
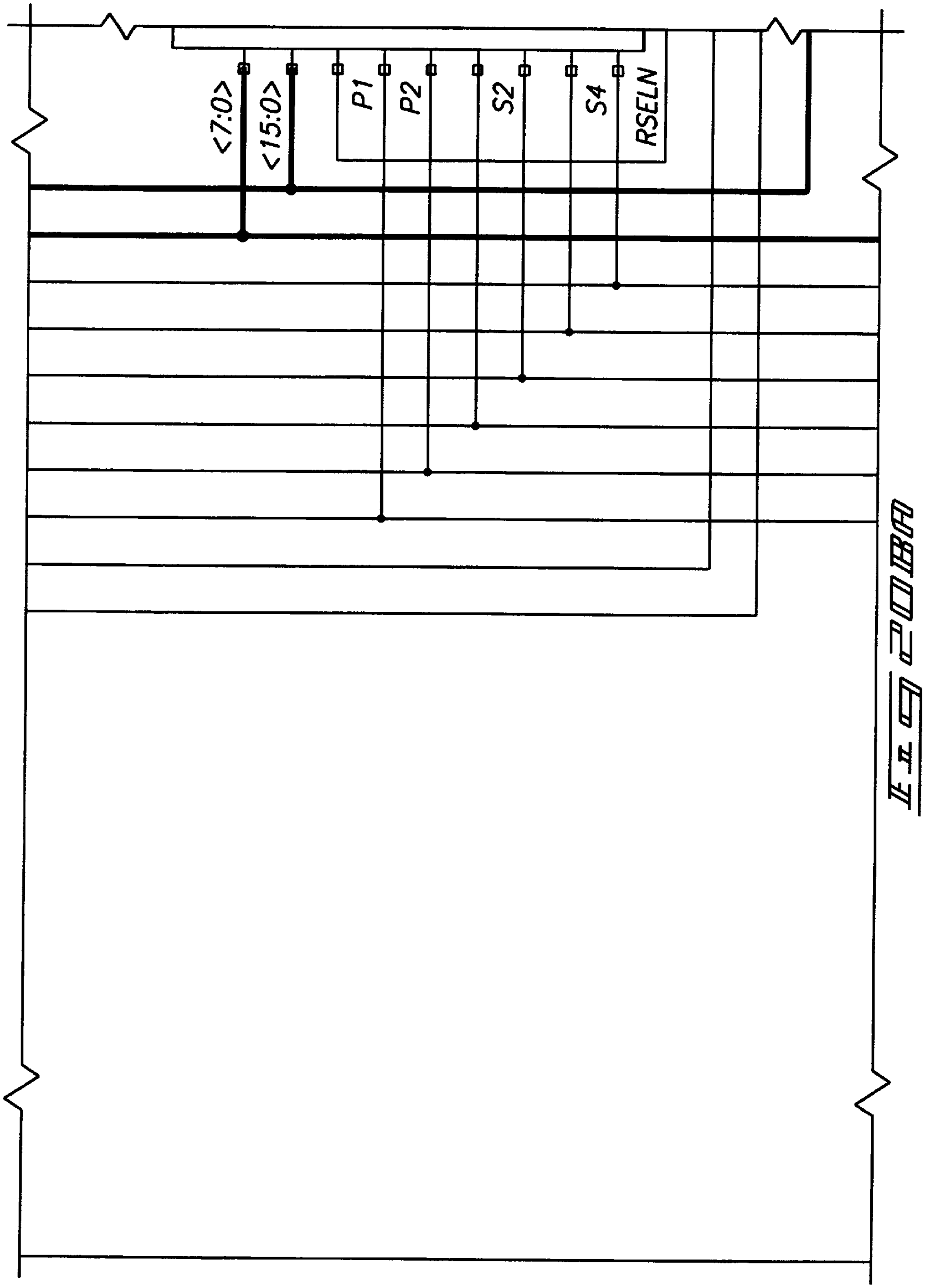
Figure 20B:
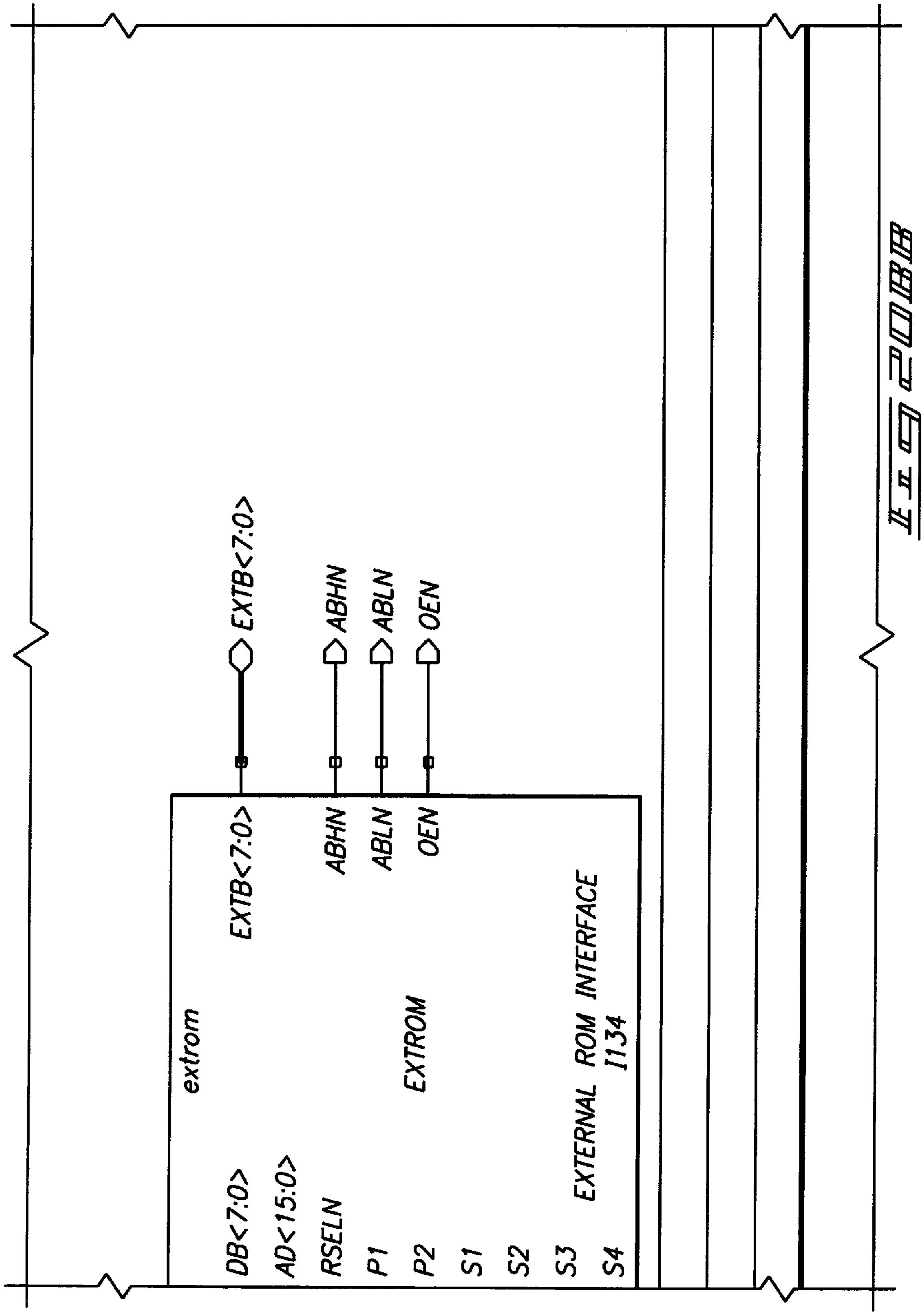
Figure 208C:
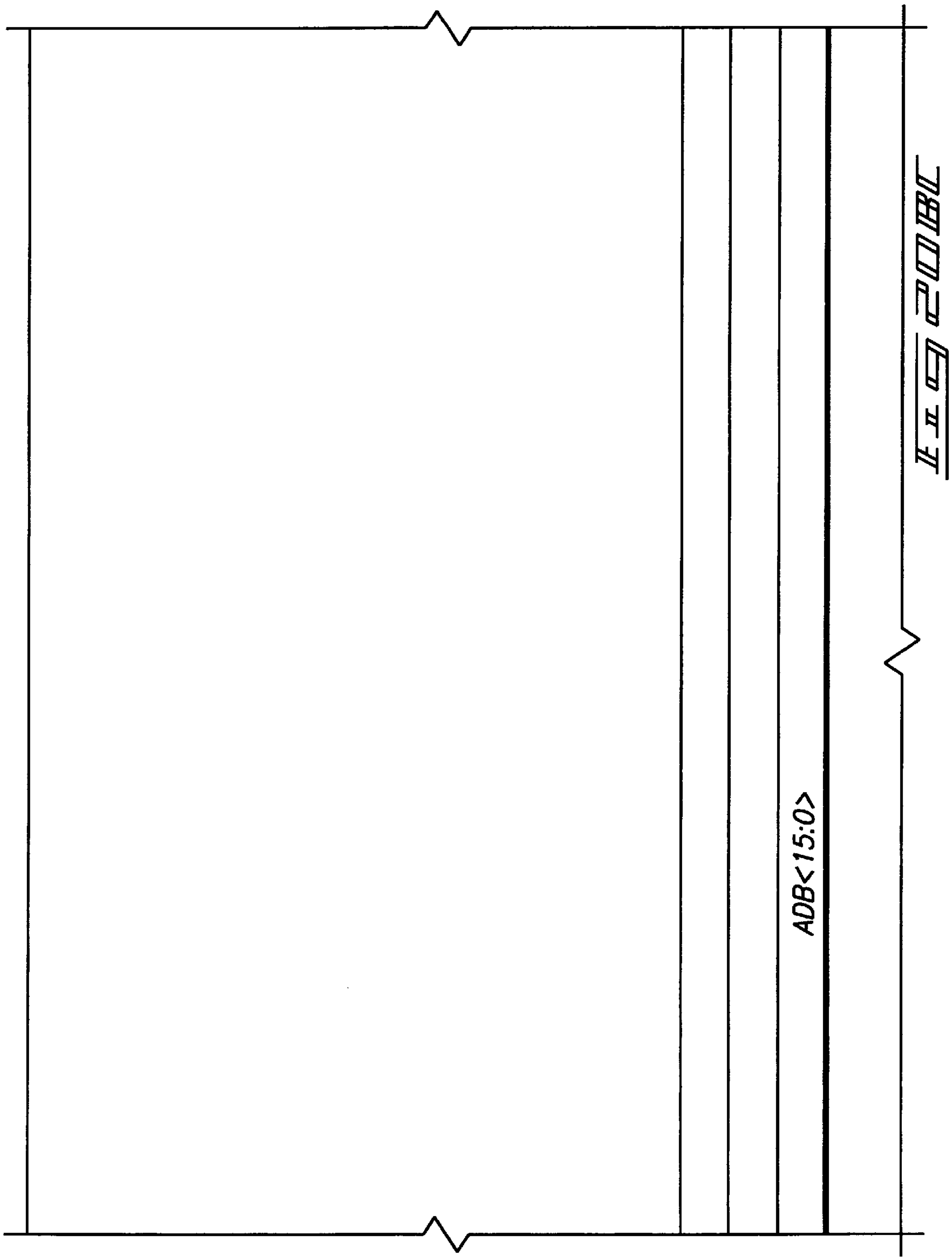
Figure 20B:
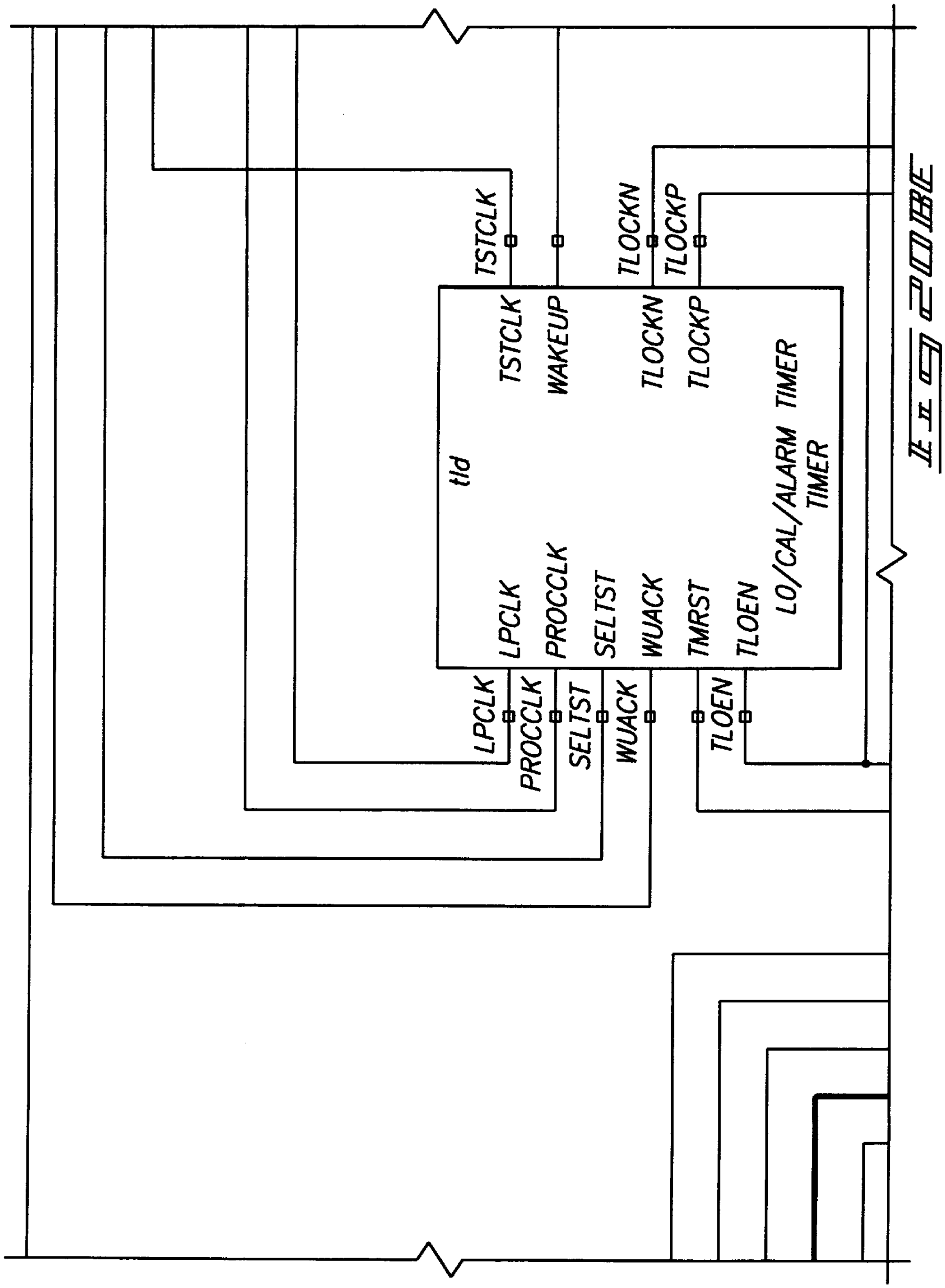
Figure 20B:
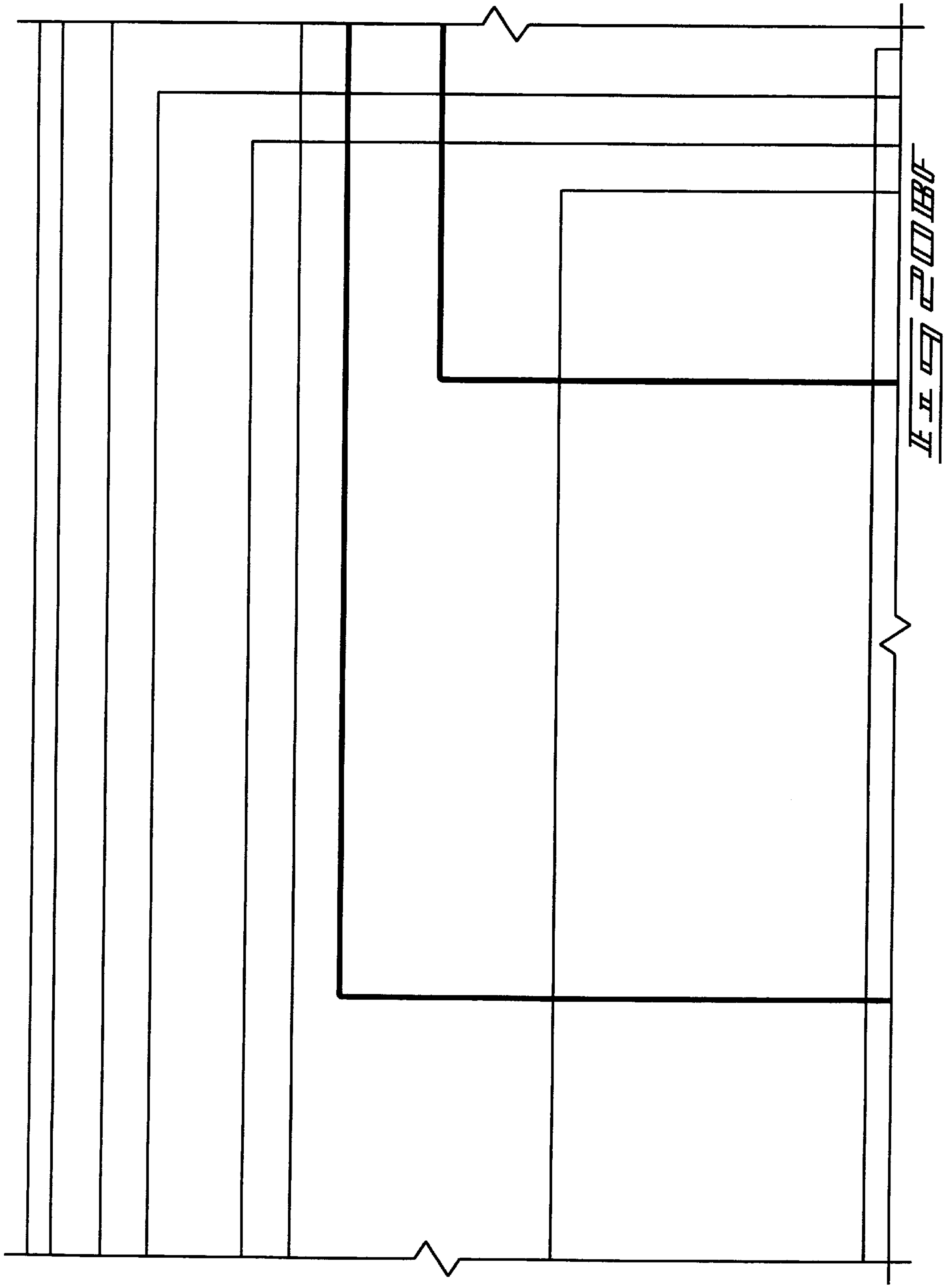
Figure 20B:
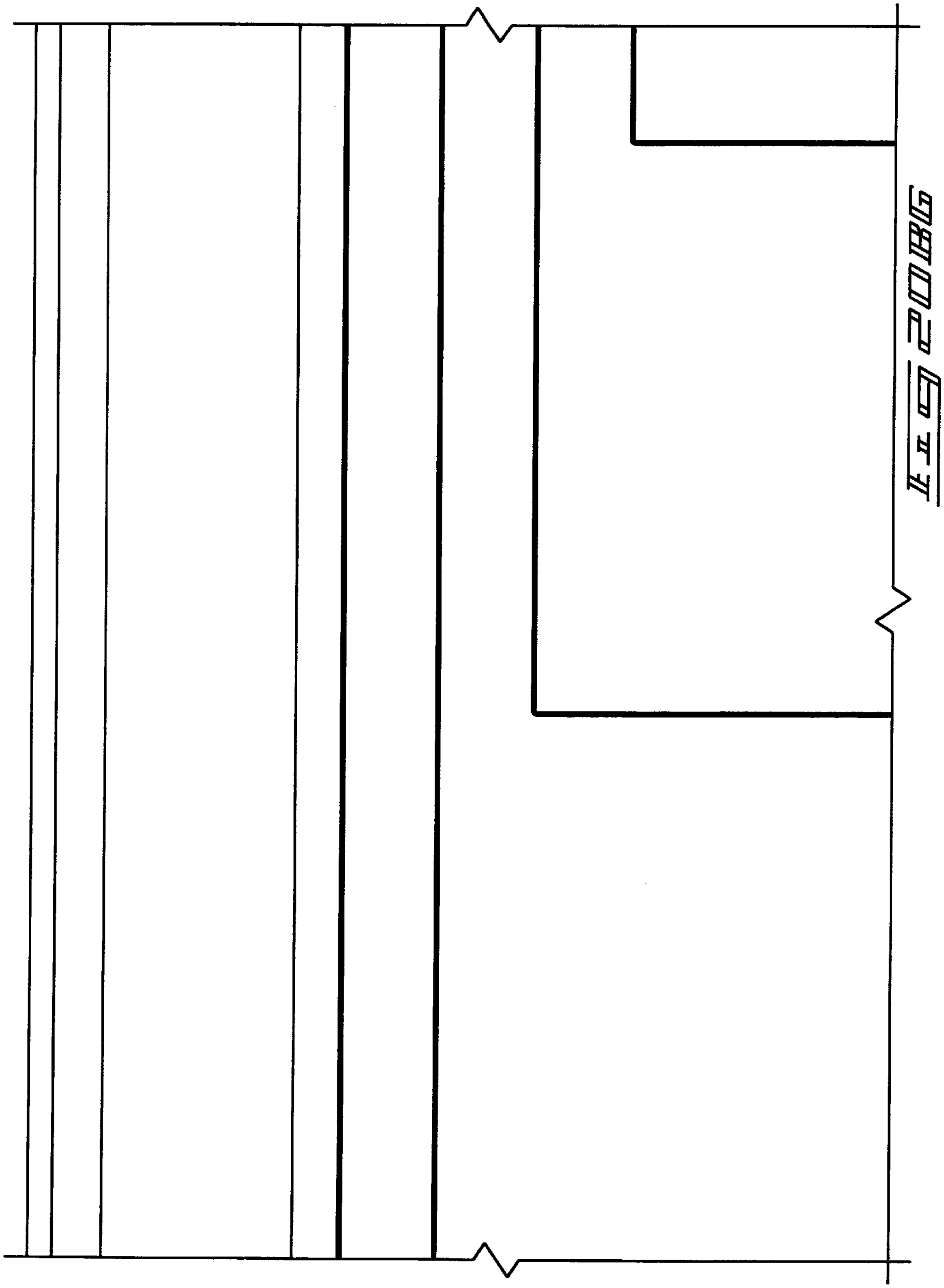
Figure 208H:
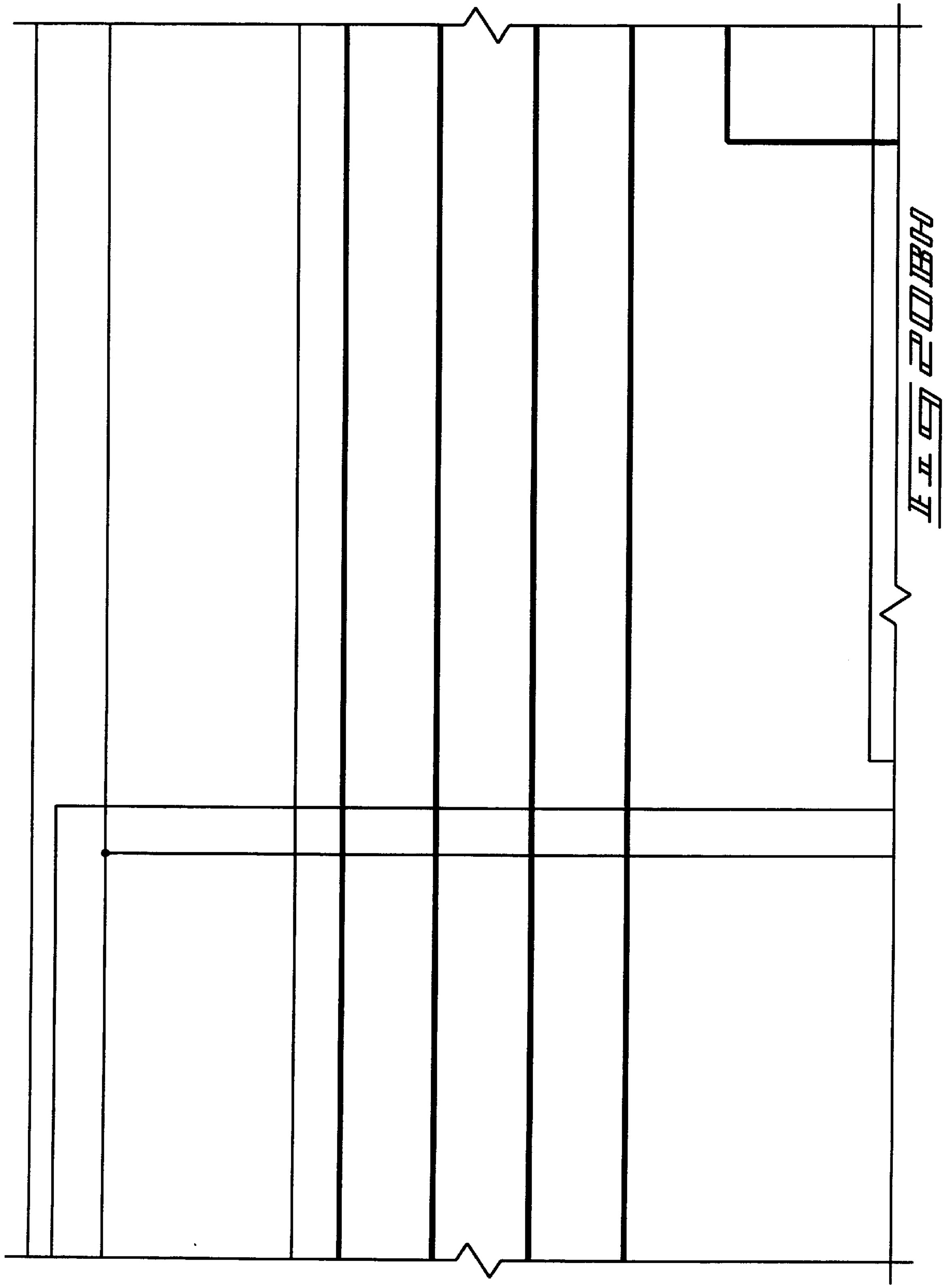
Figure 208I:
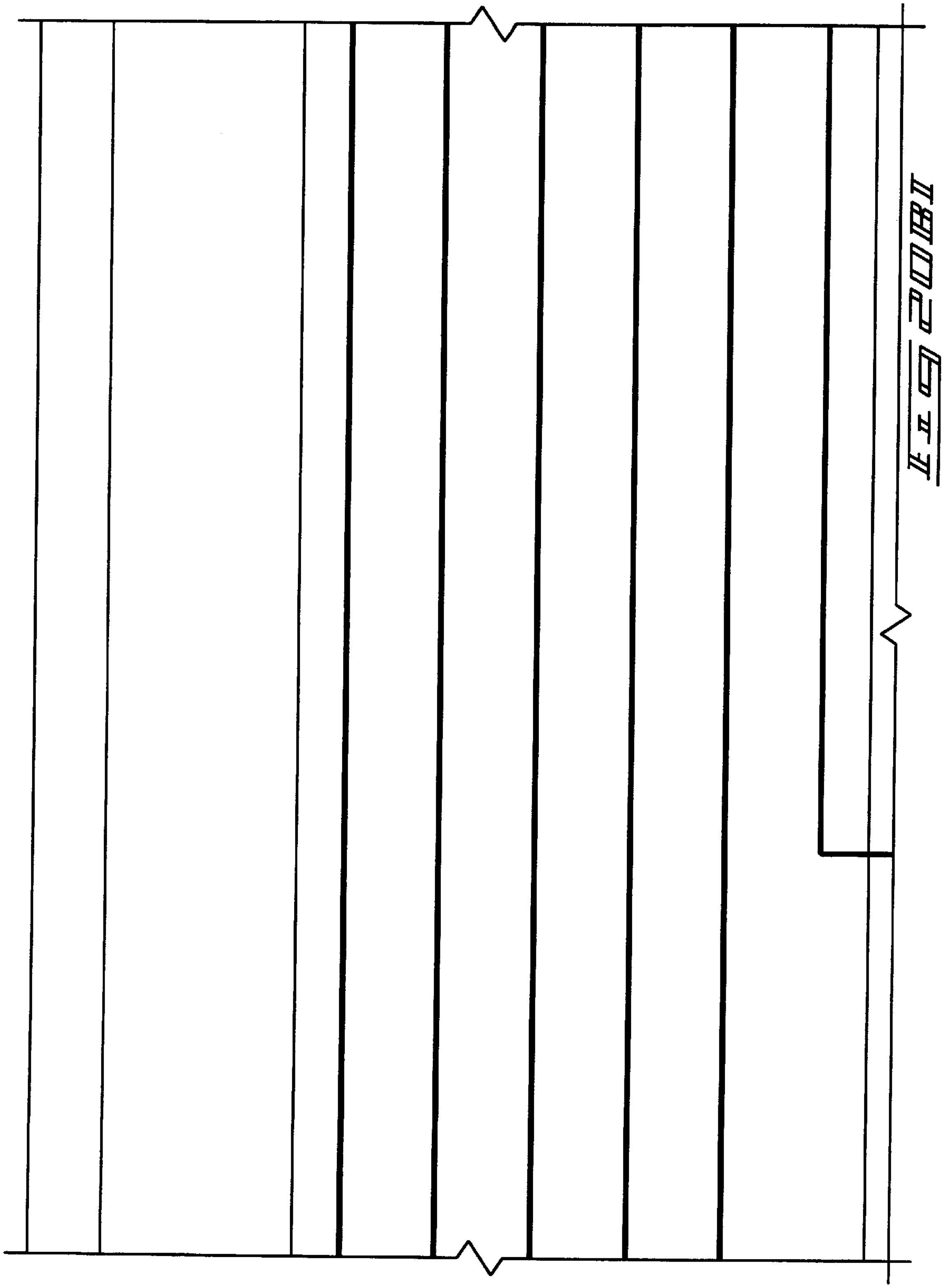
Figure 20B:
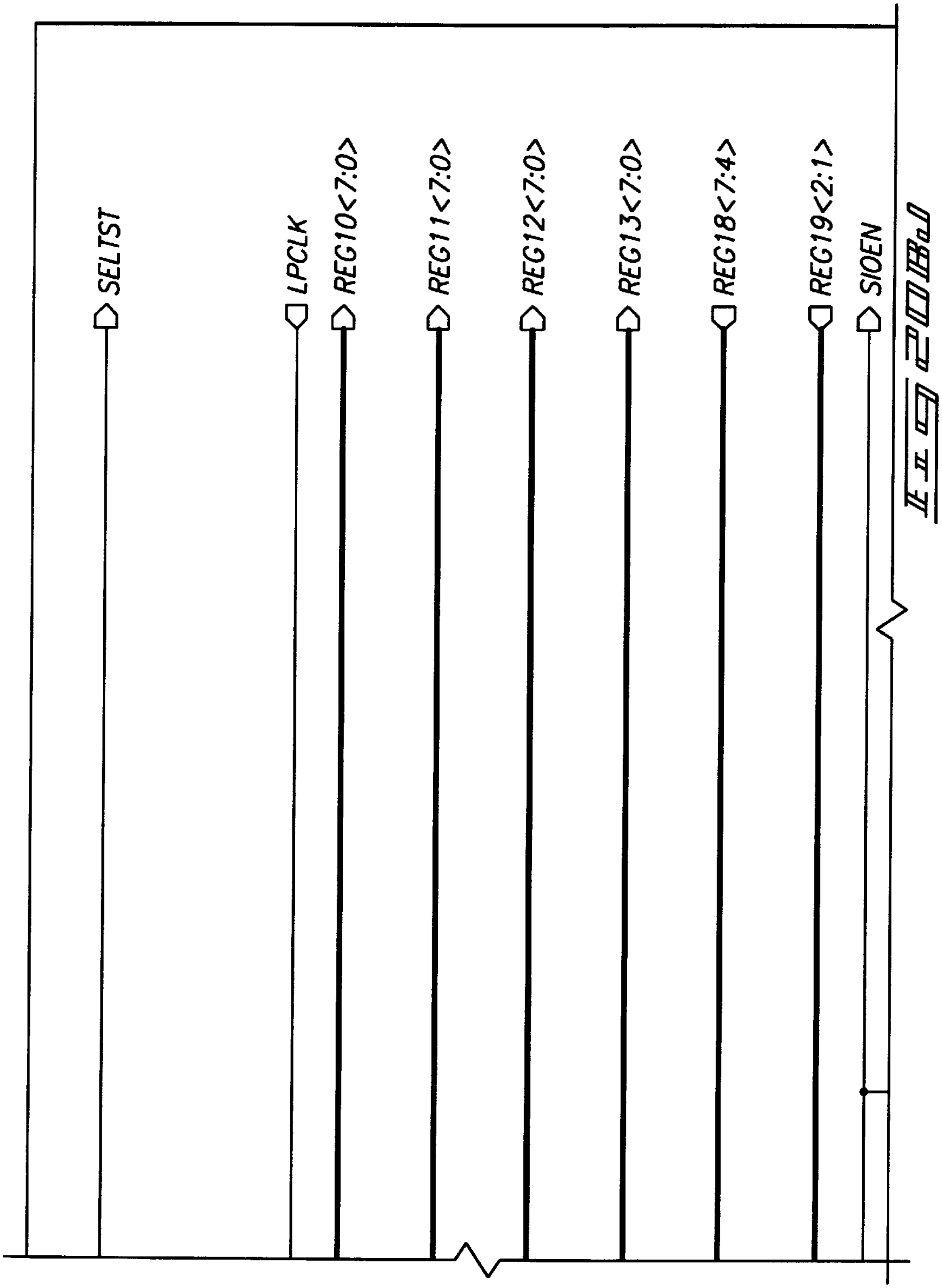
Figure 20C:
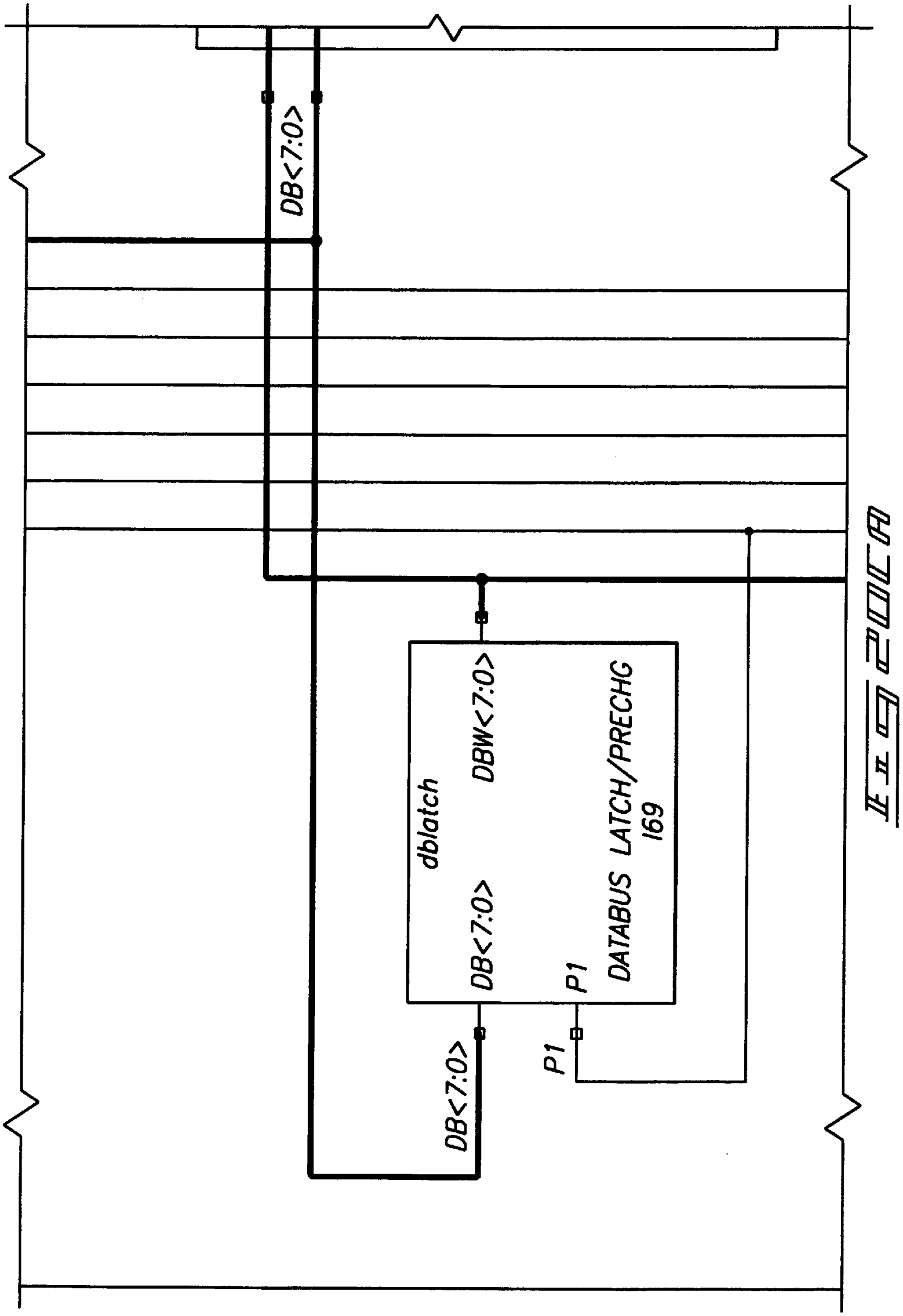
Figure 20C:
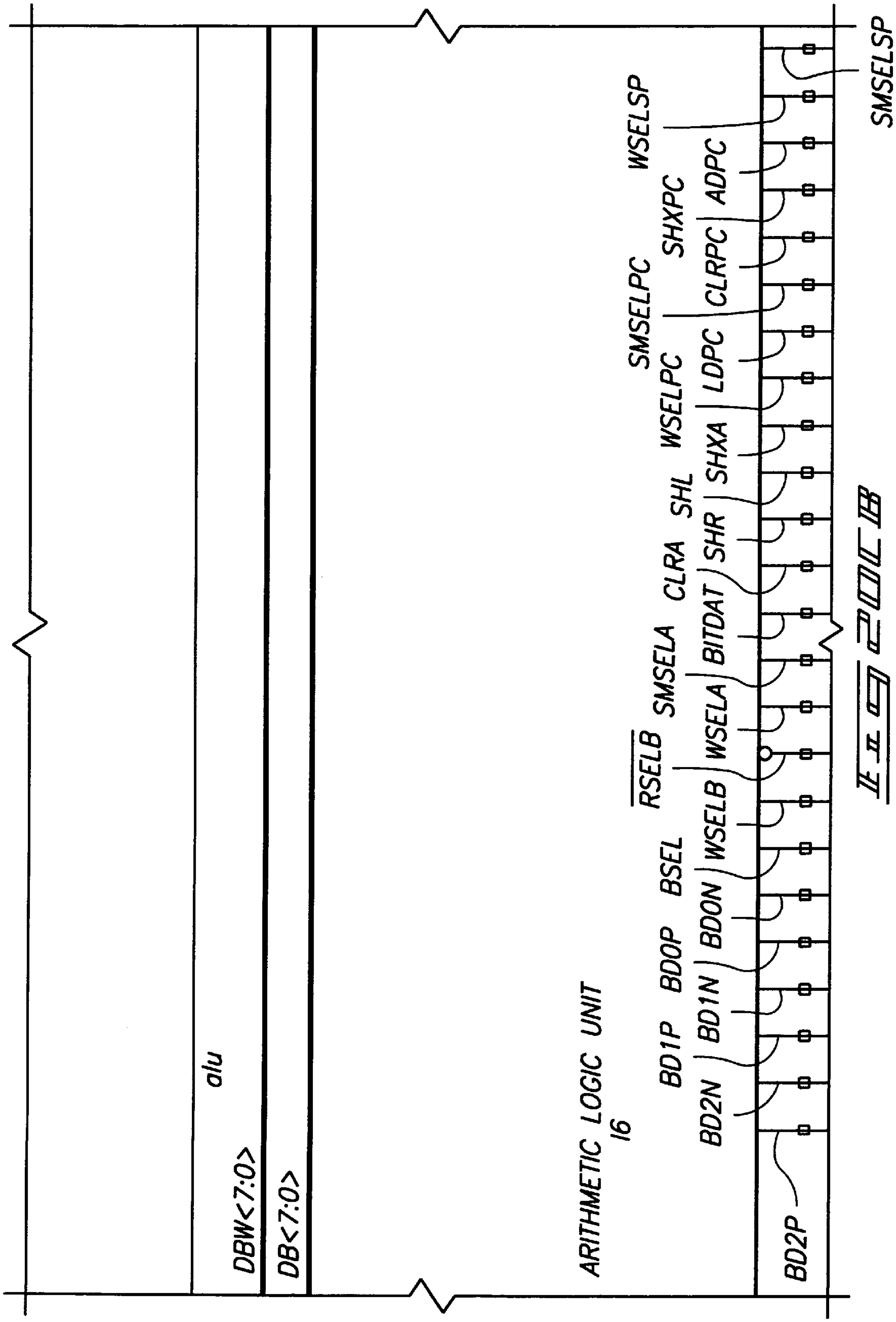
Figure 20C:
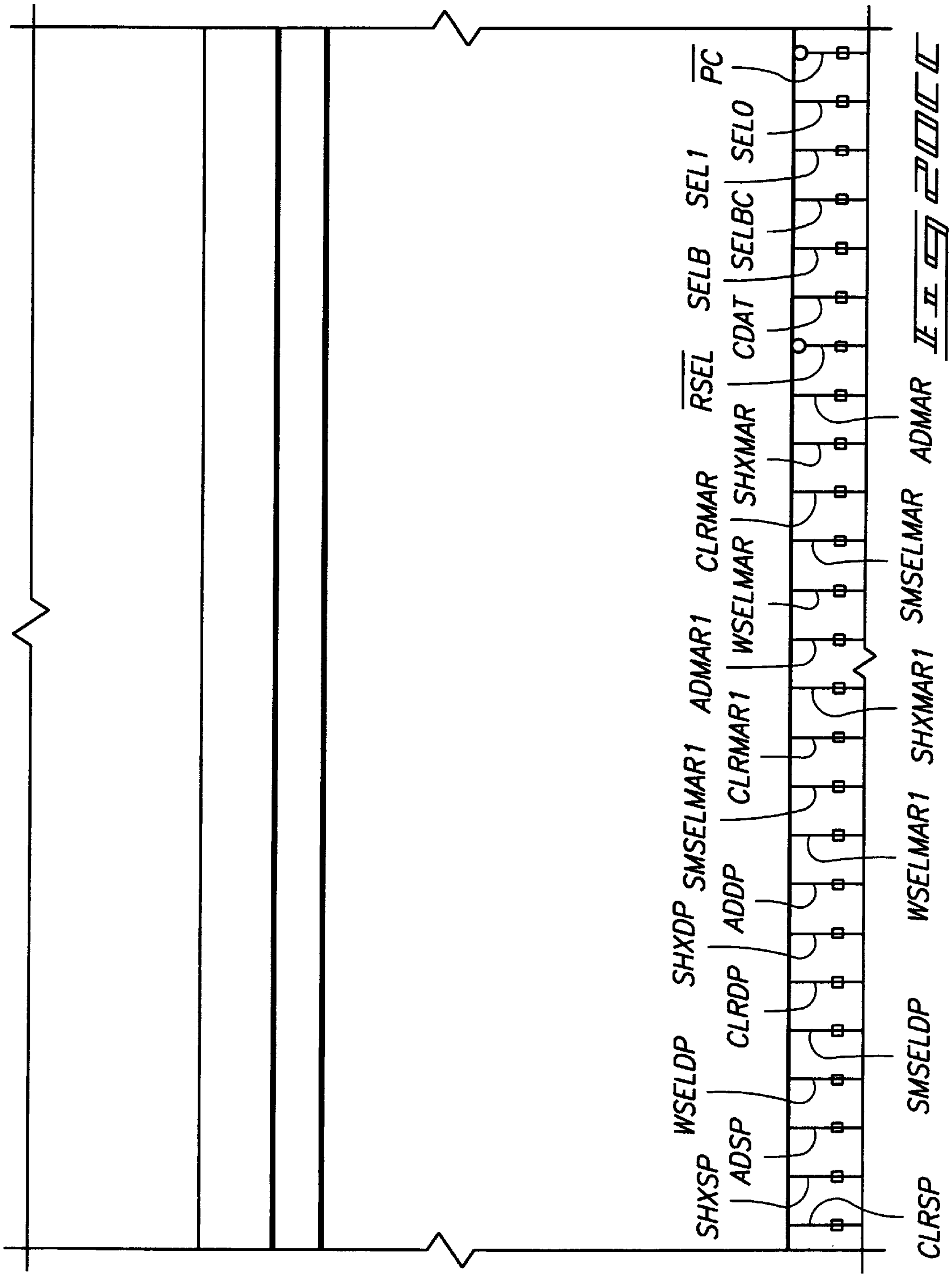
Figure 20C:
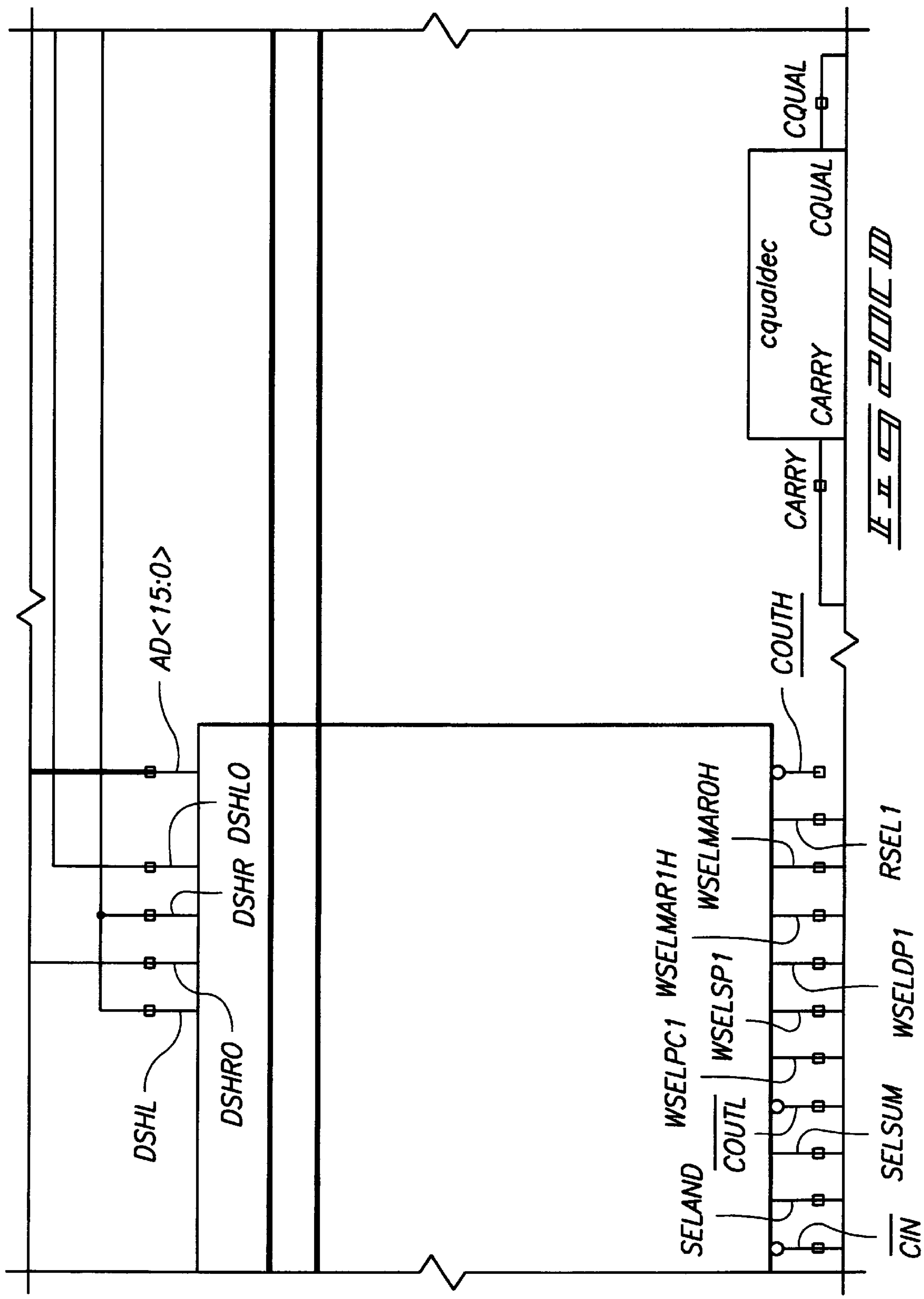
Figure 20C:
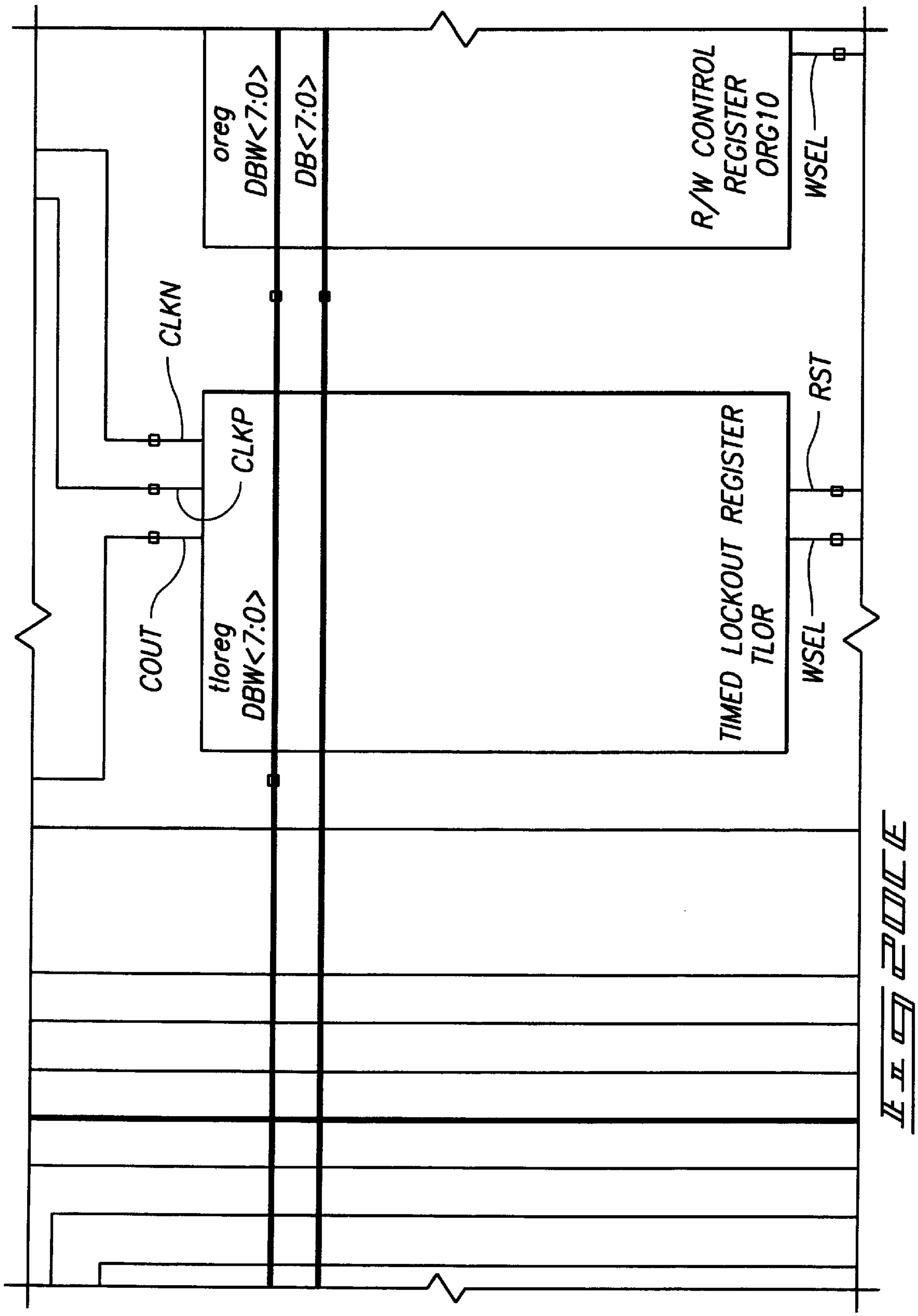
Figure 20C:
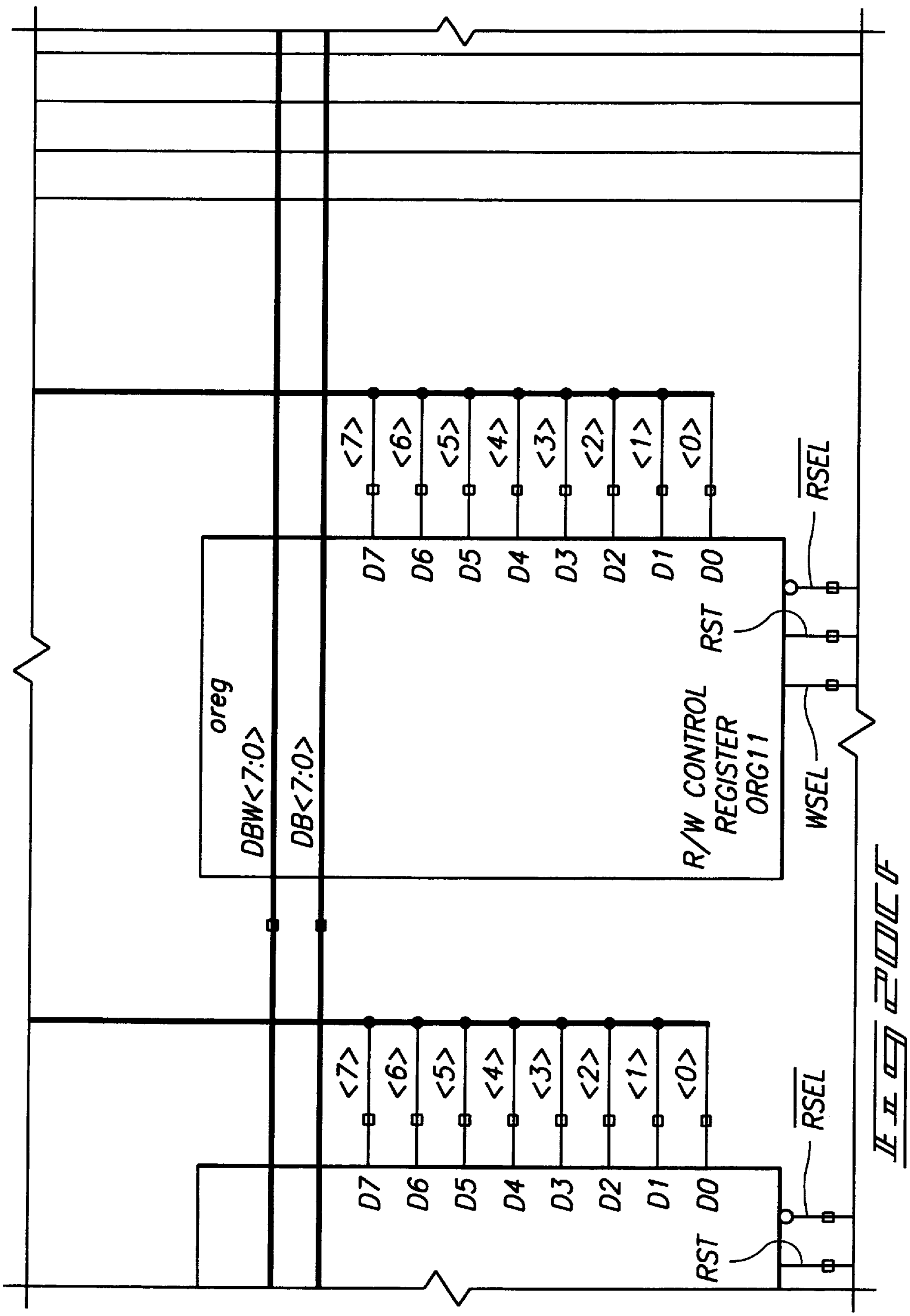
Figure 20C:
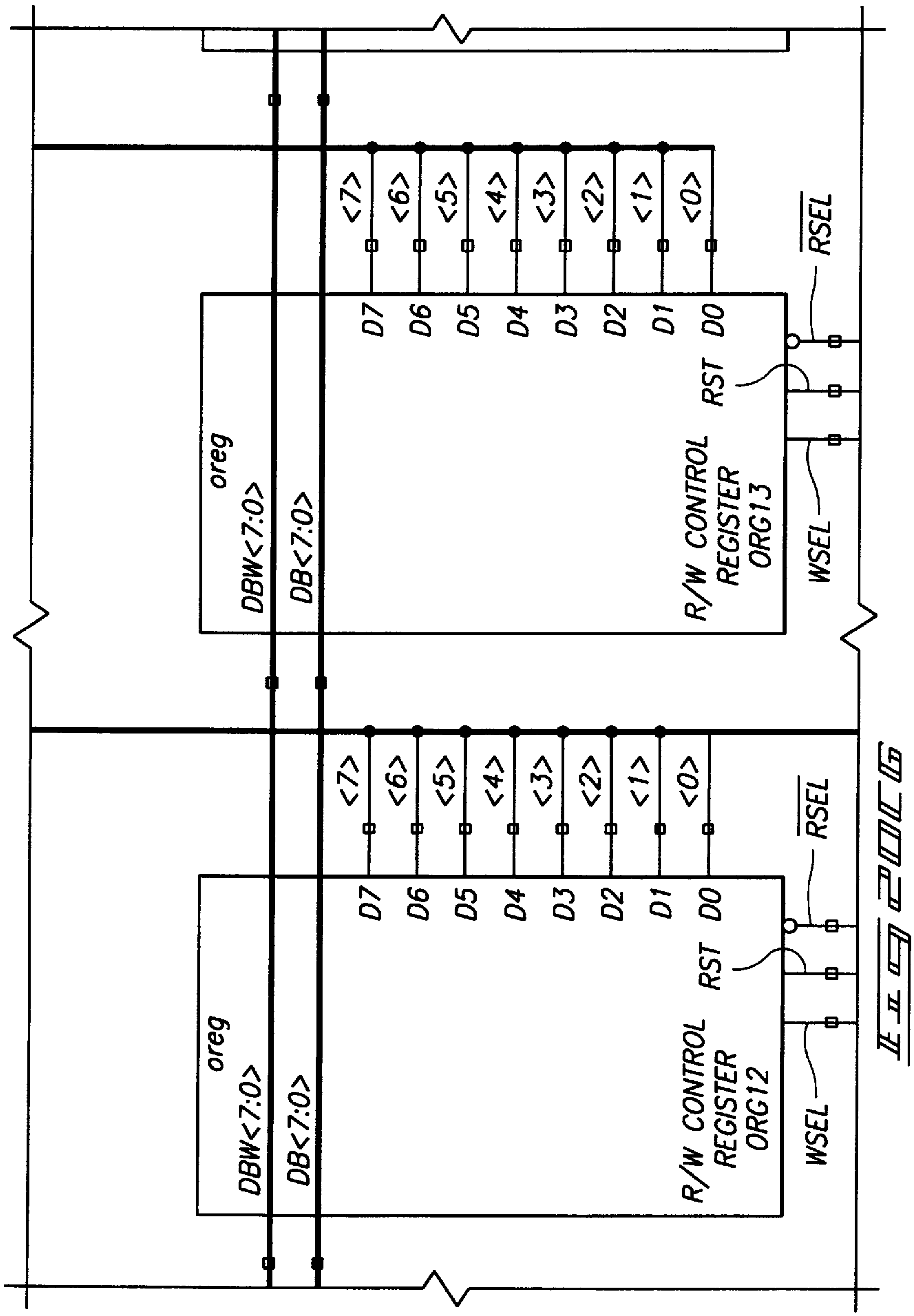
Figure 20C:
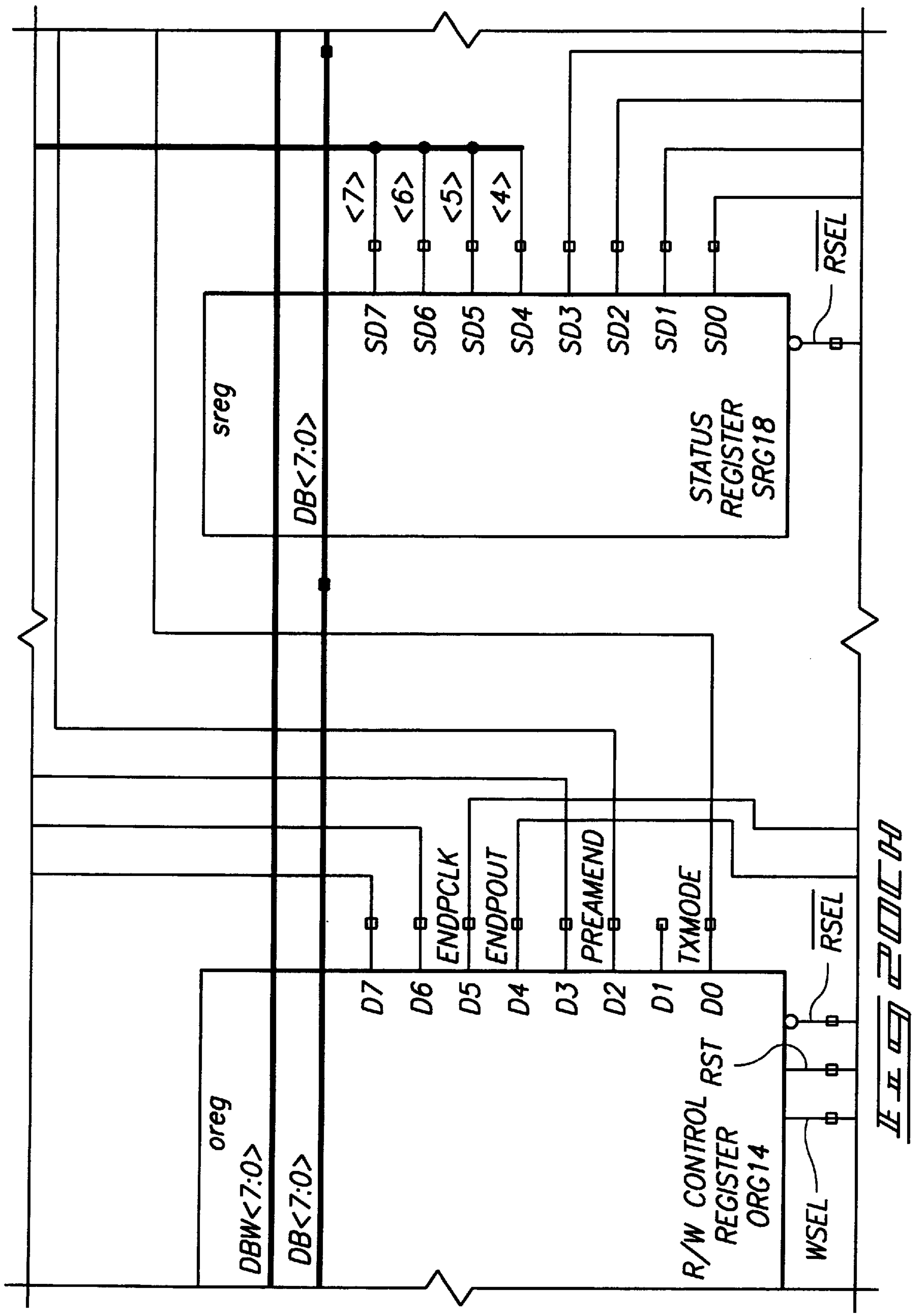
Figure 20C:
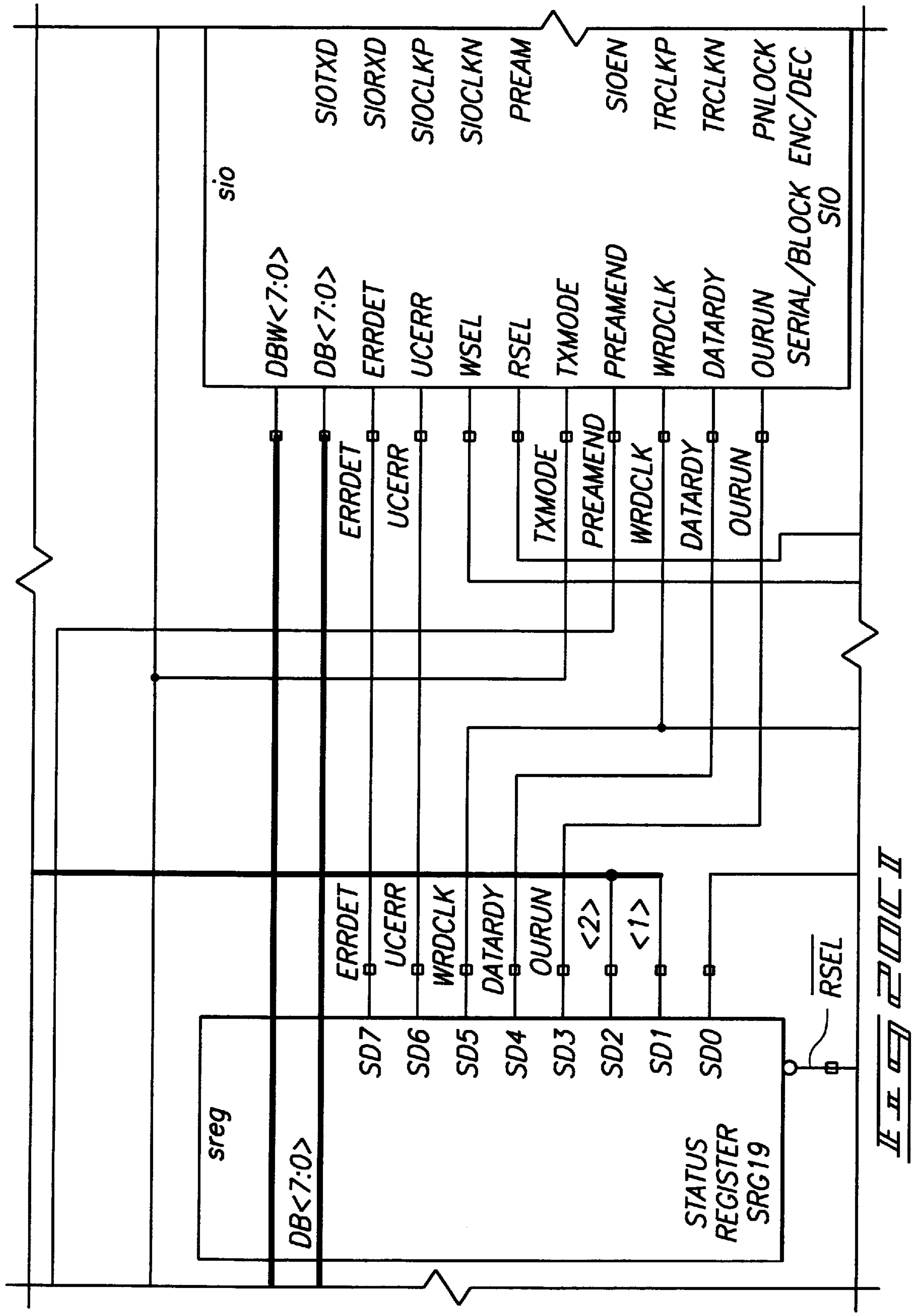
Figure 20C:
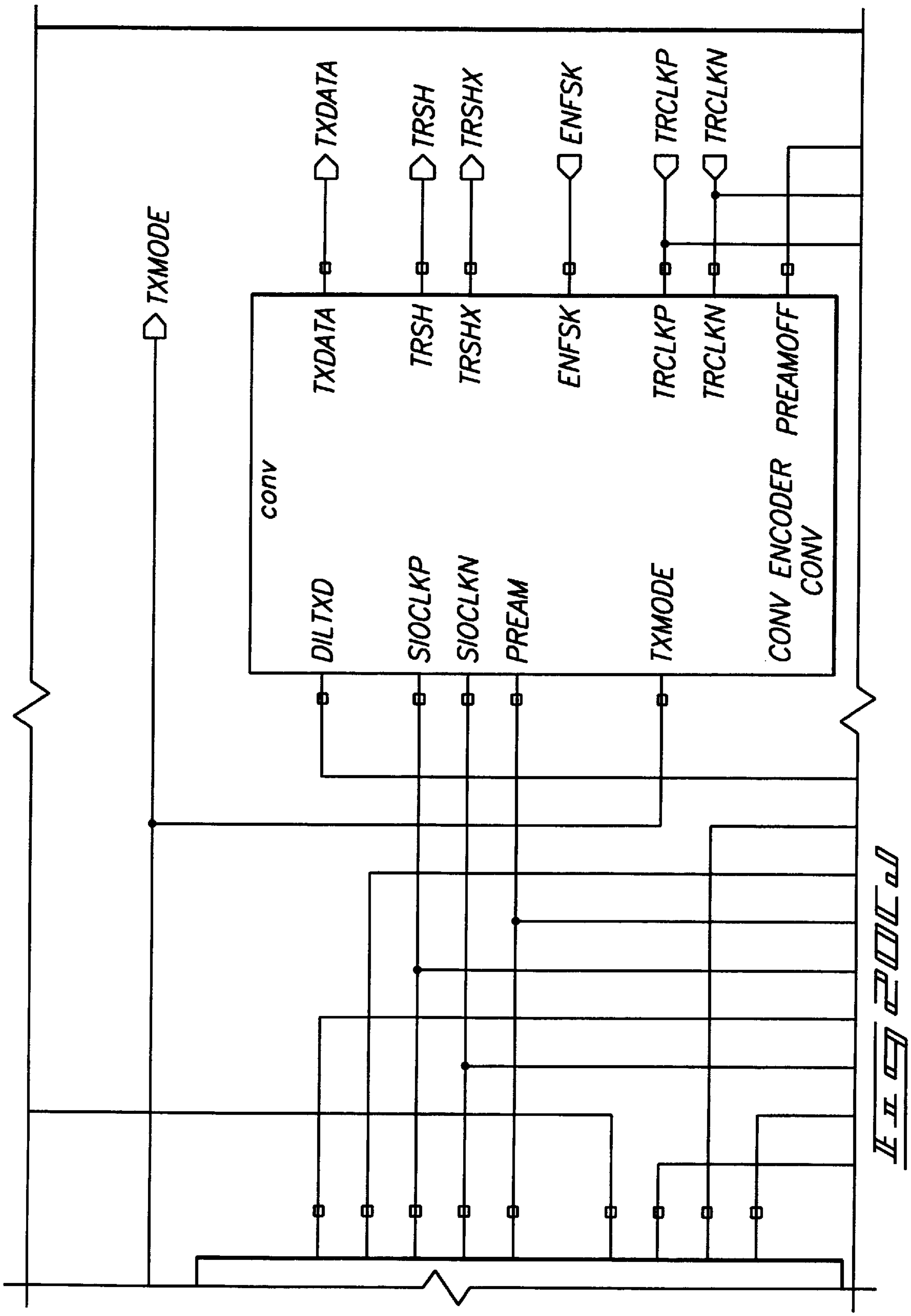
Figure 200A:
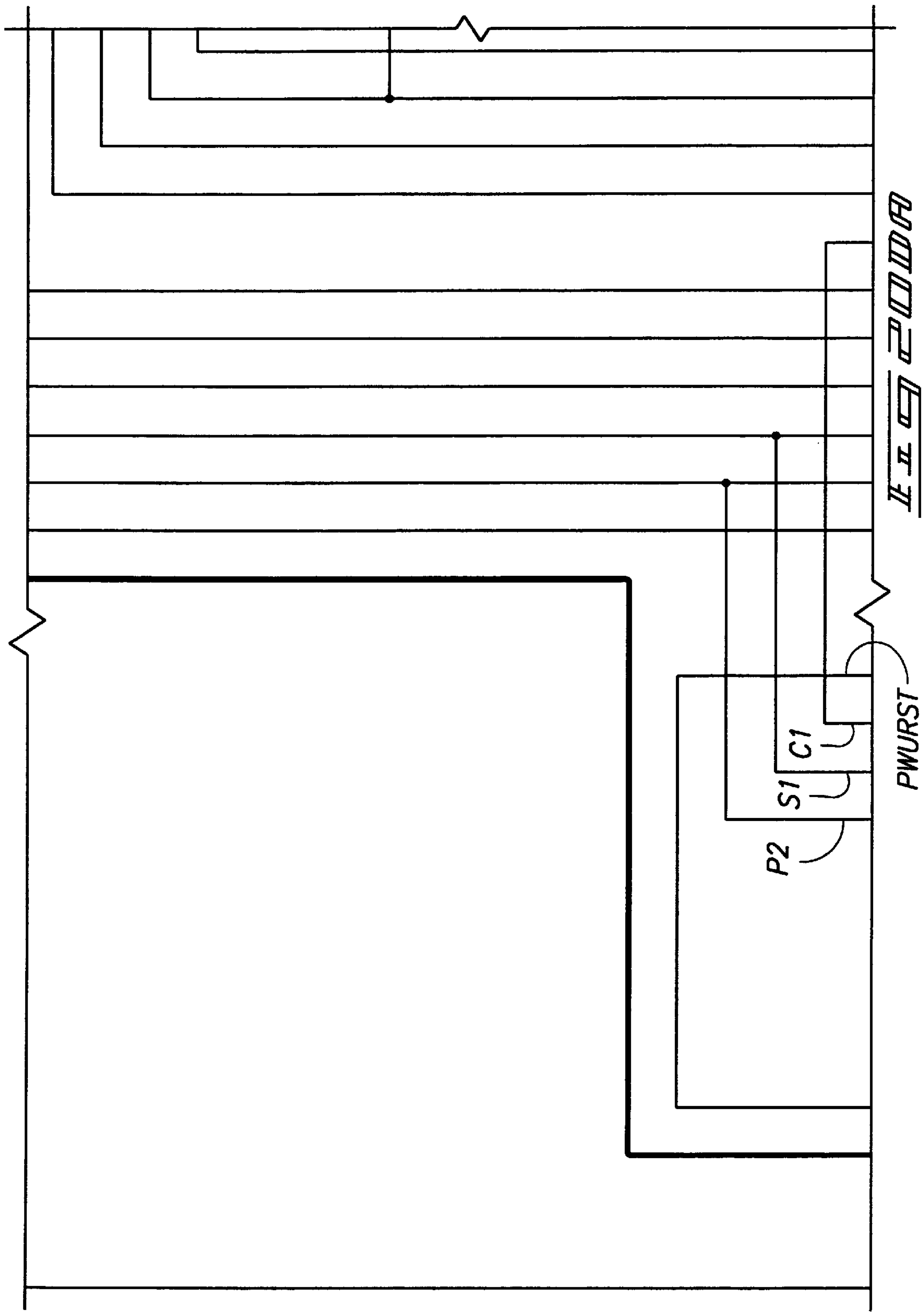
Figure 200B:
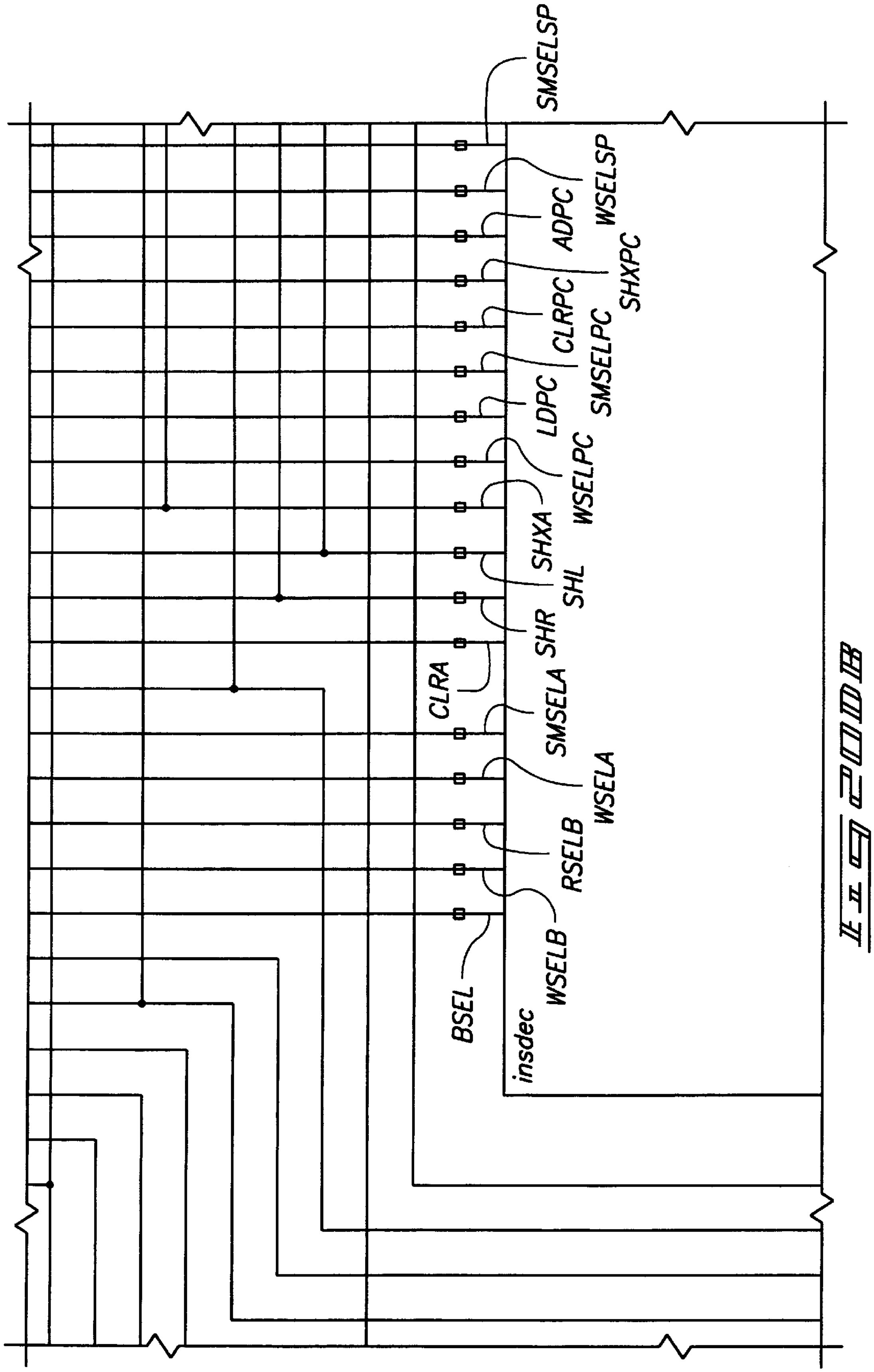
Figure 20D:
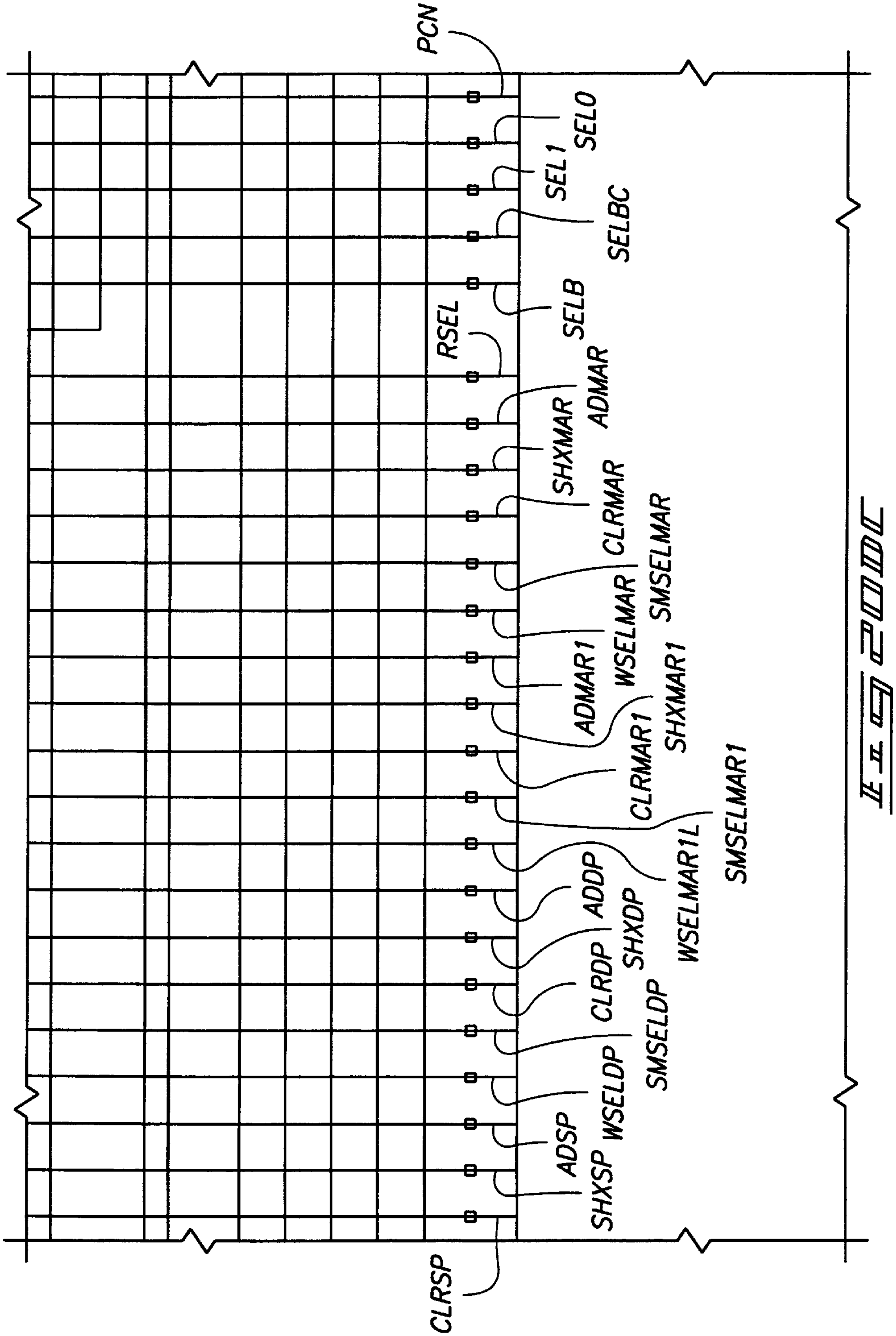
Figure 200D:
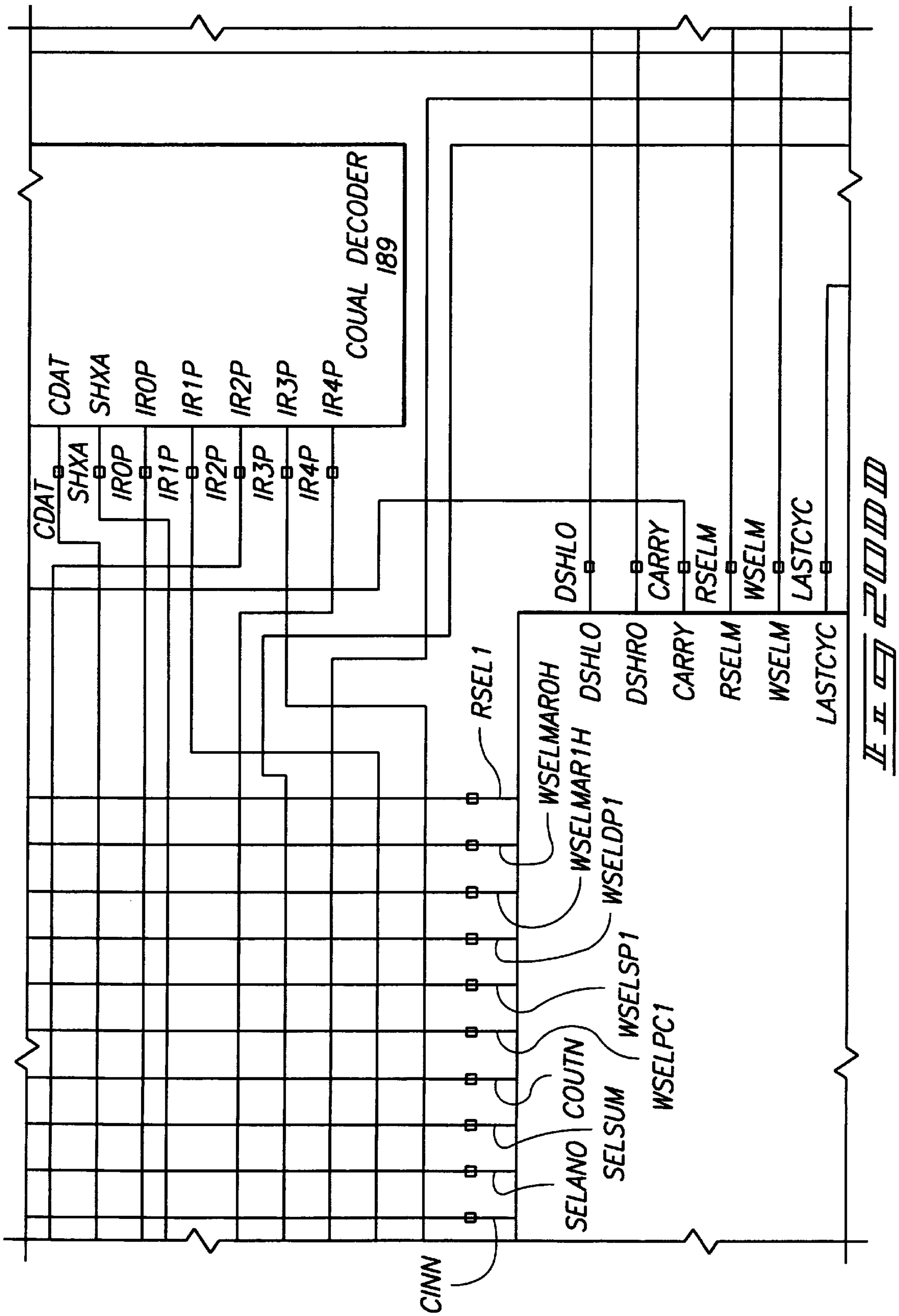
Figure 200E:
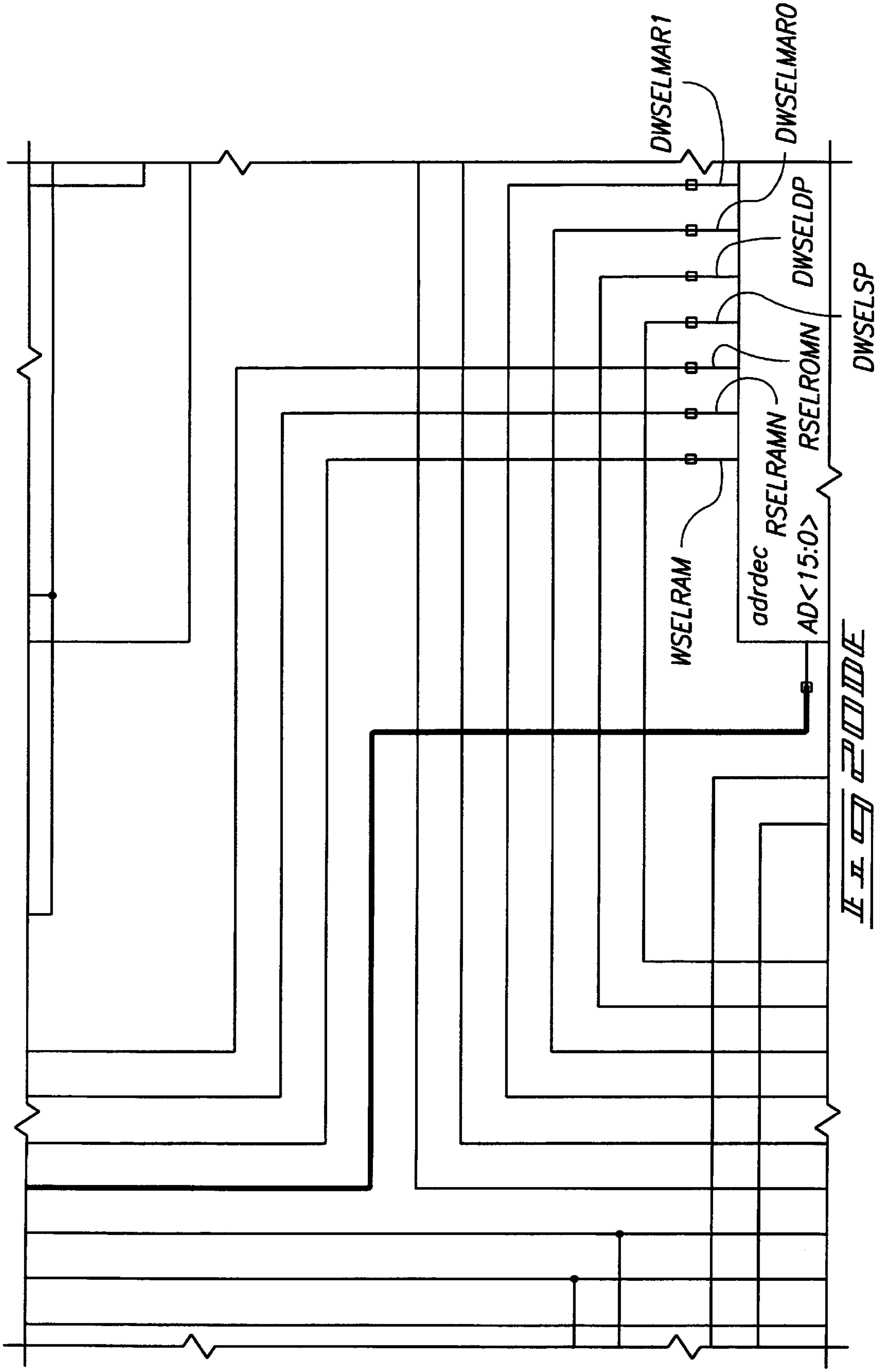
Figure 20D:
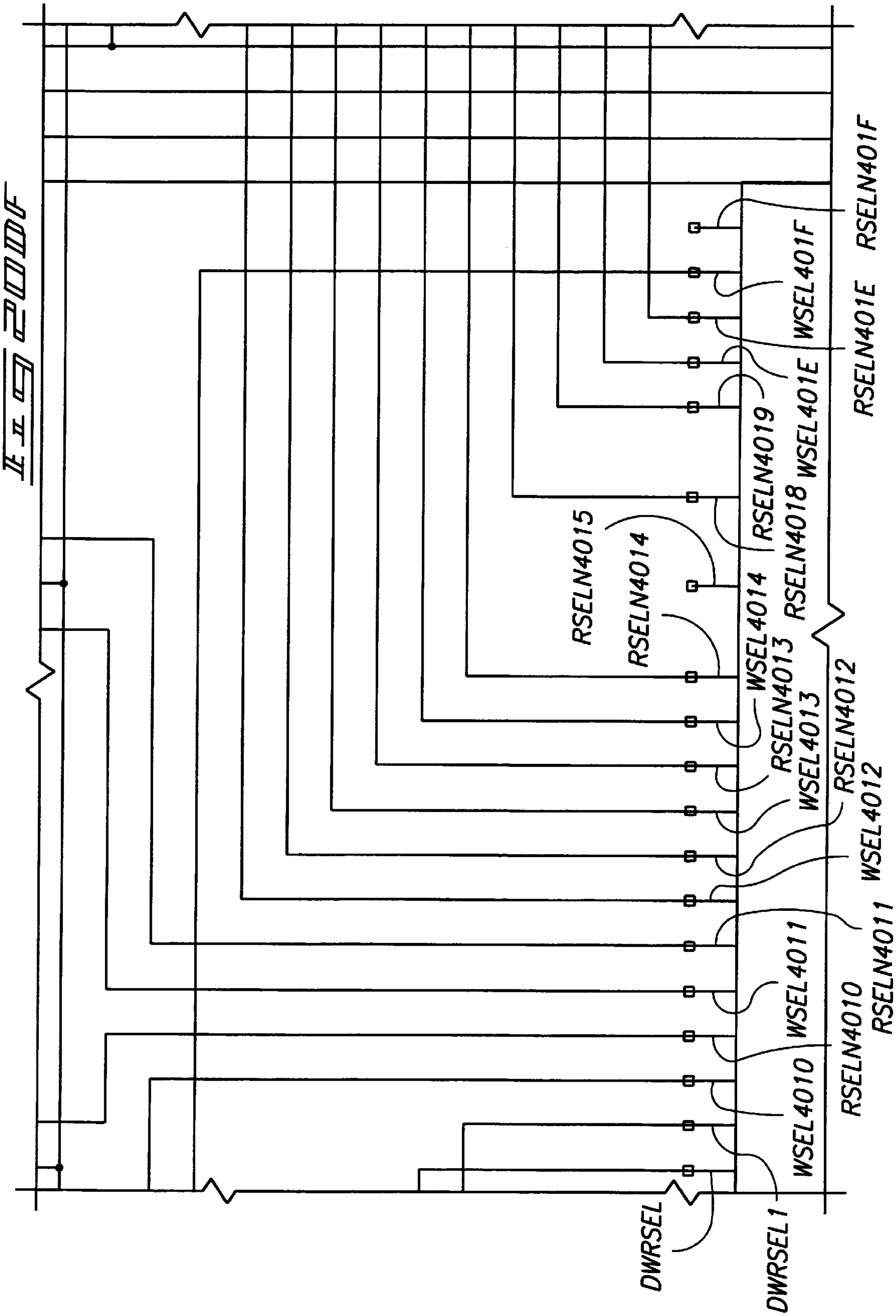
Figure 200G:
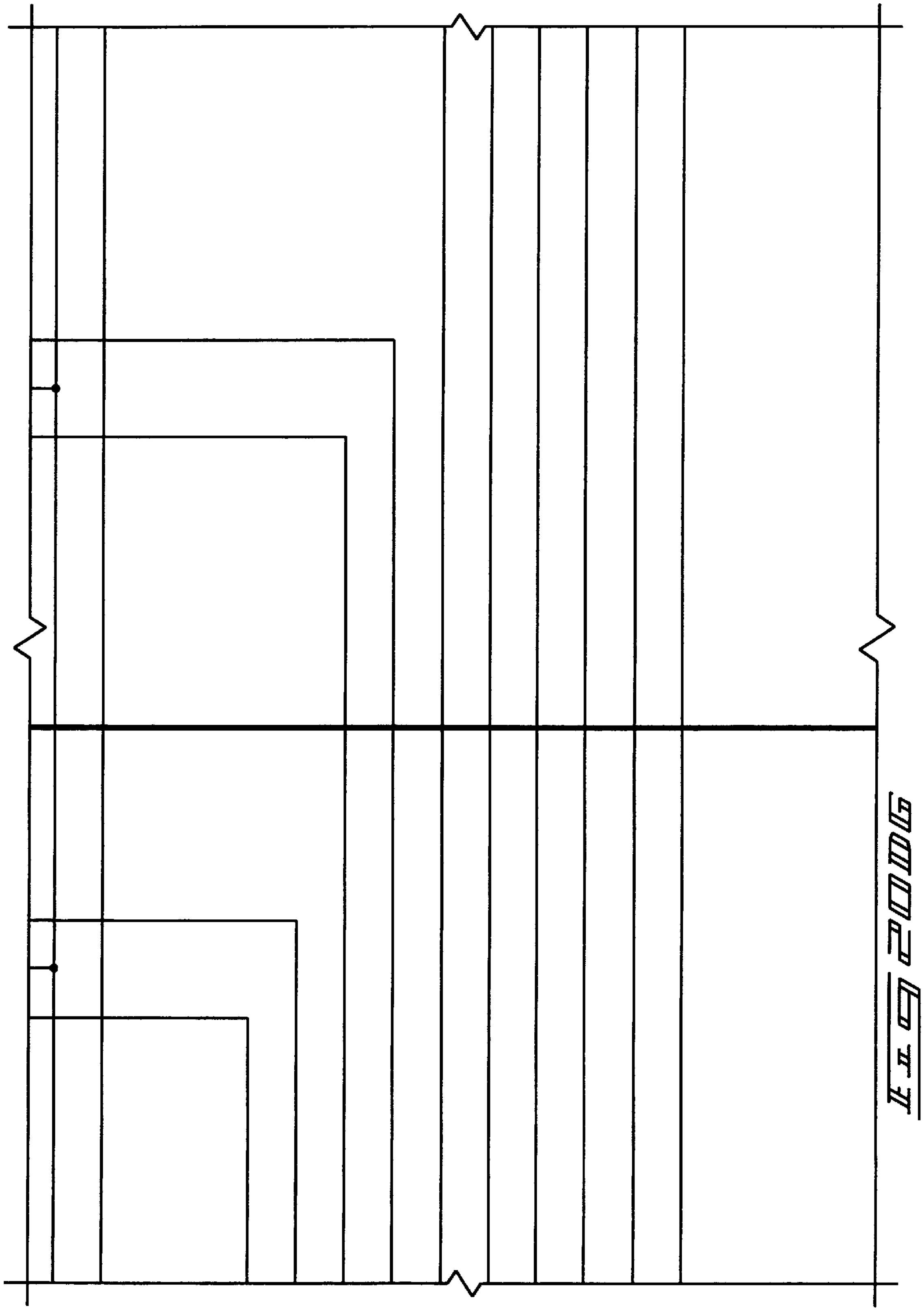
Figure 200H:
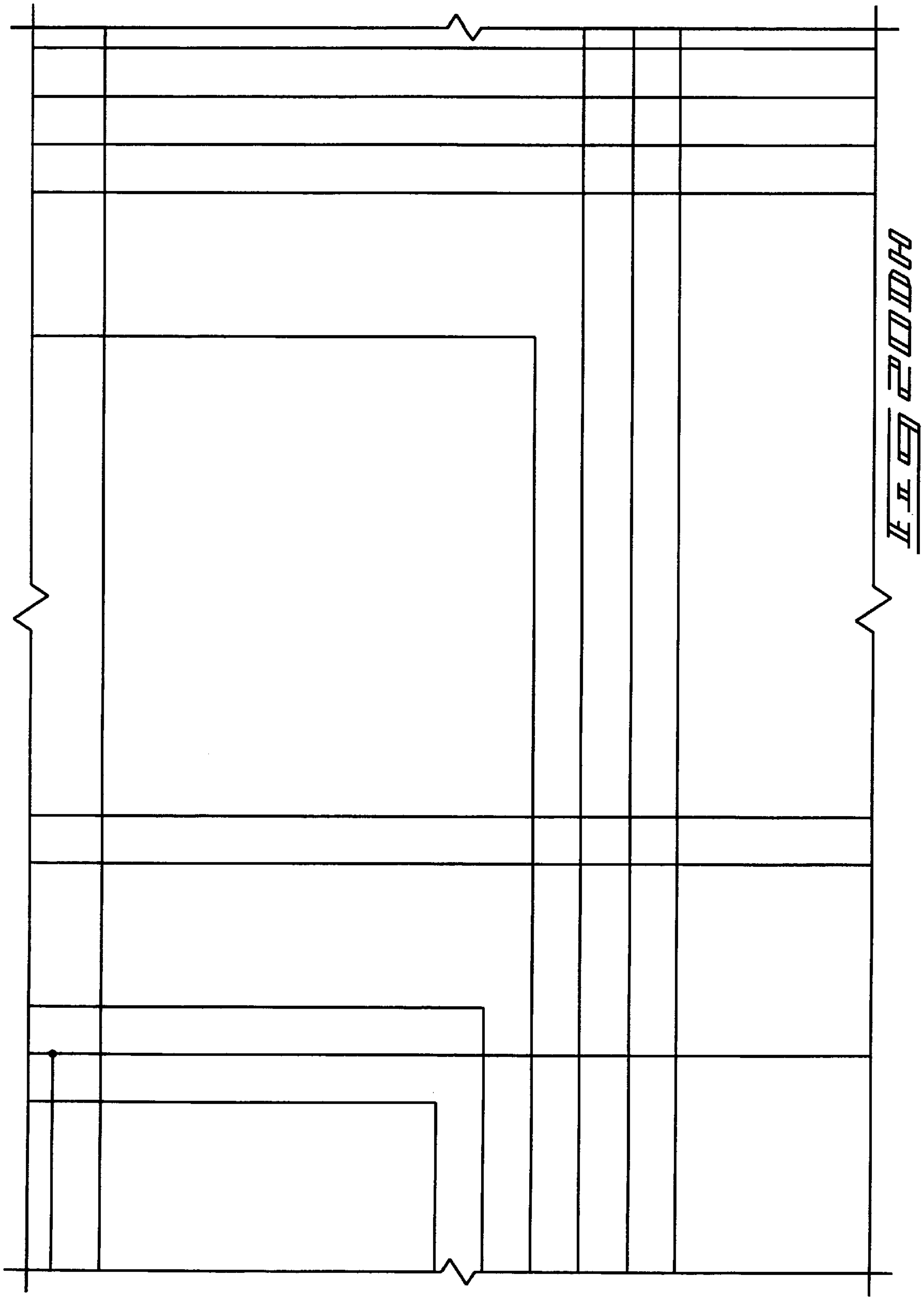
Figure 200I:
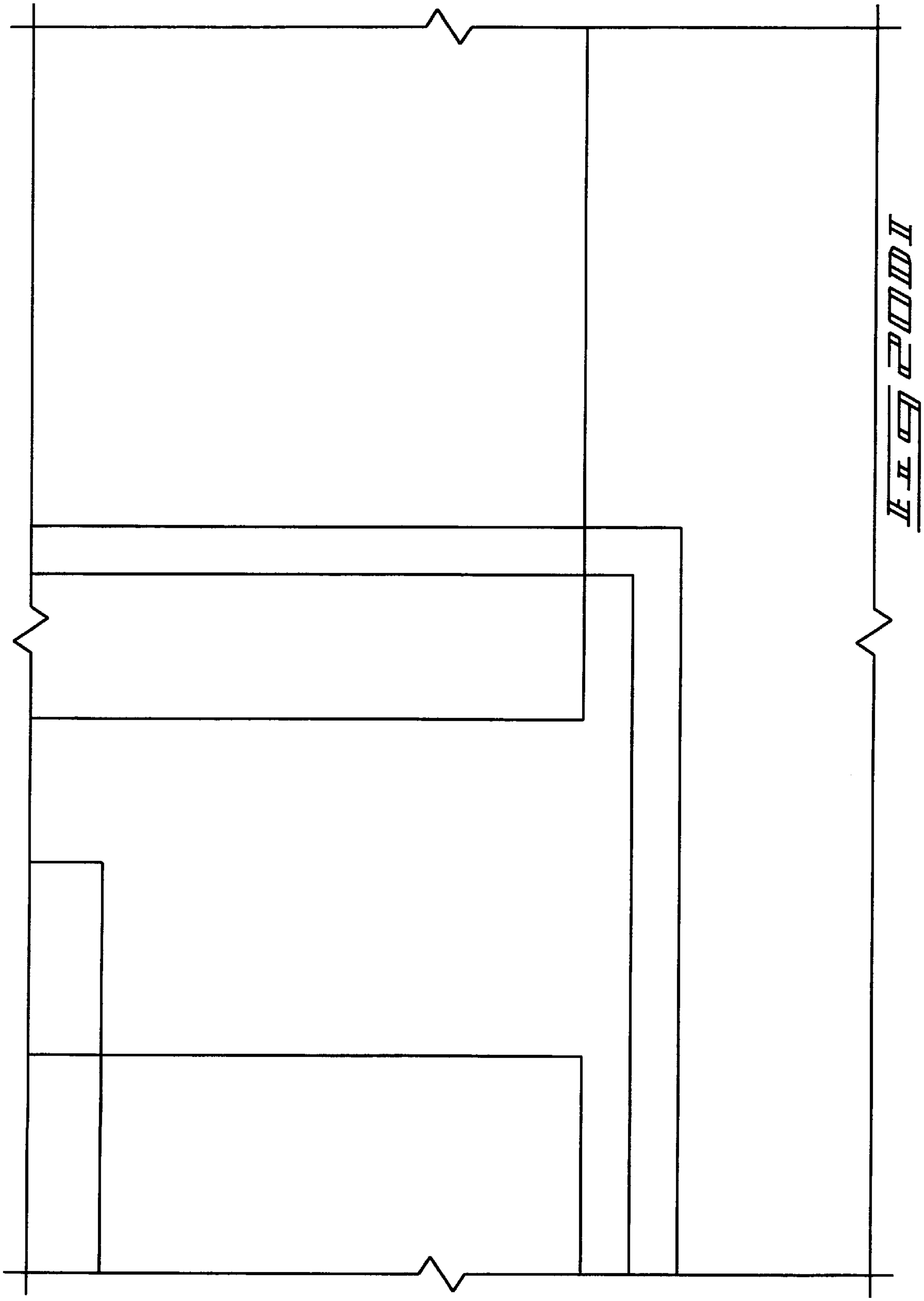
Figure 200J:
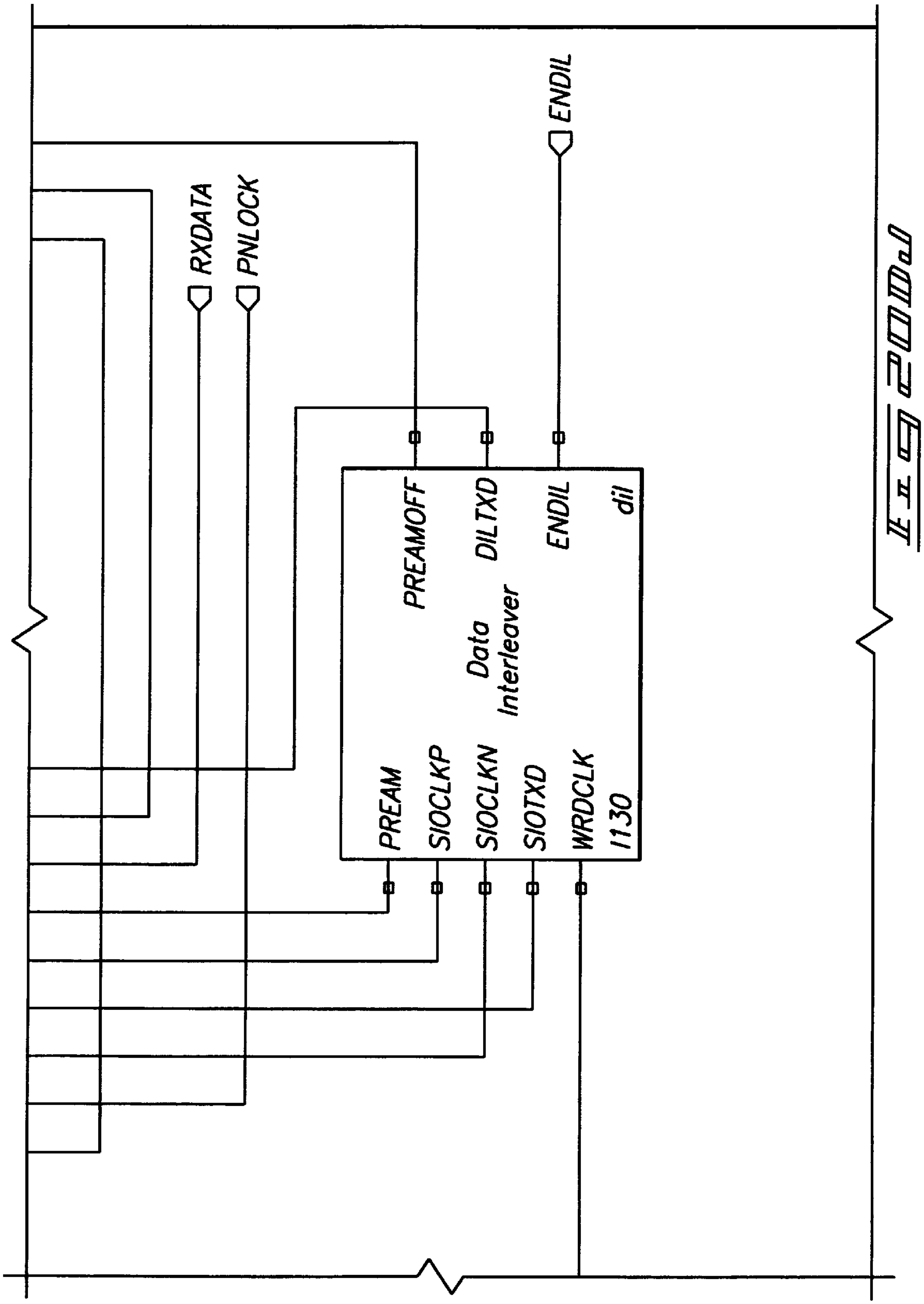
Figure 20E:
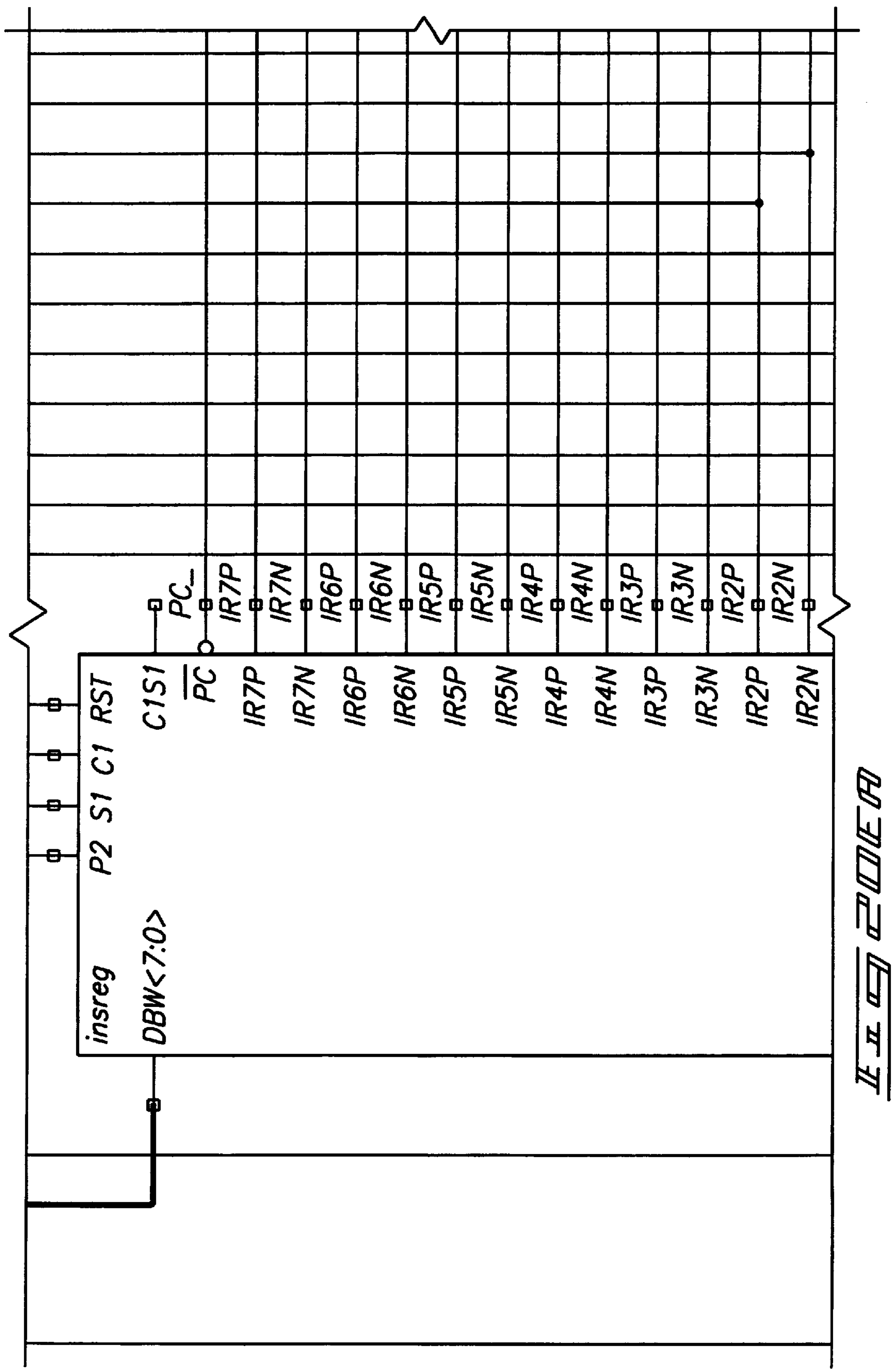
Figure 20E:
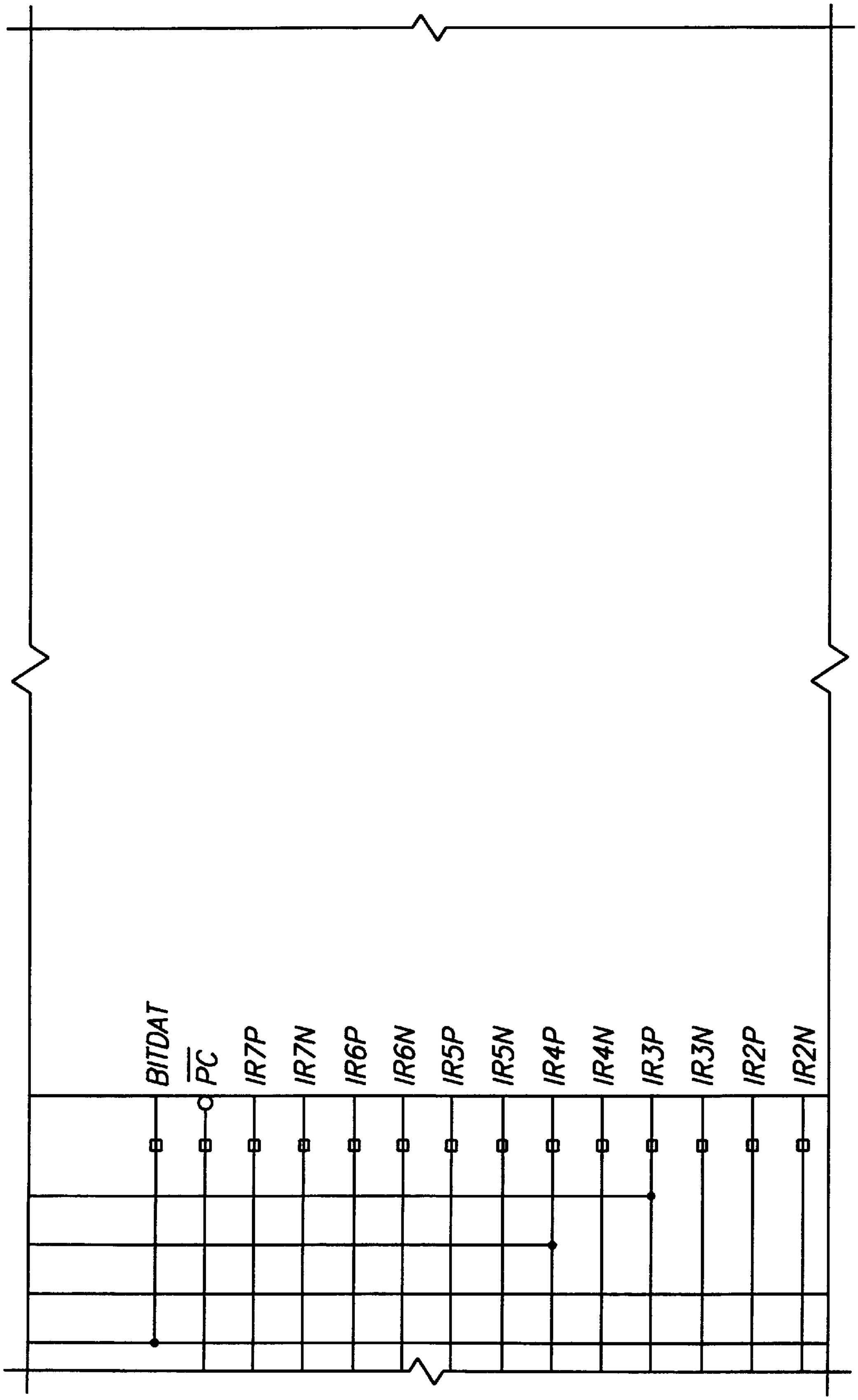
Figure 20E:
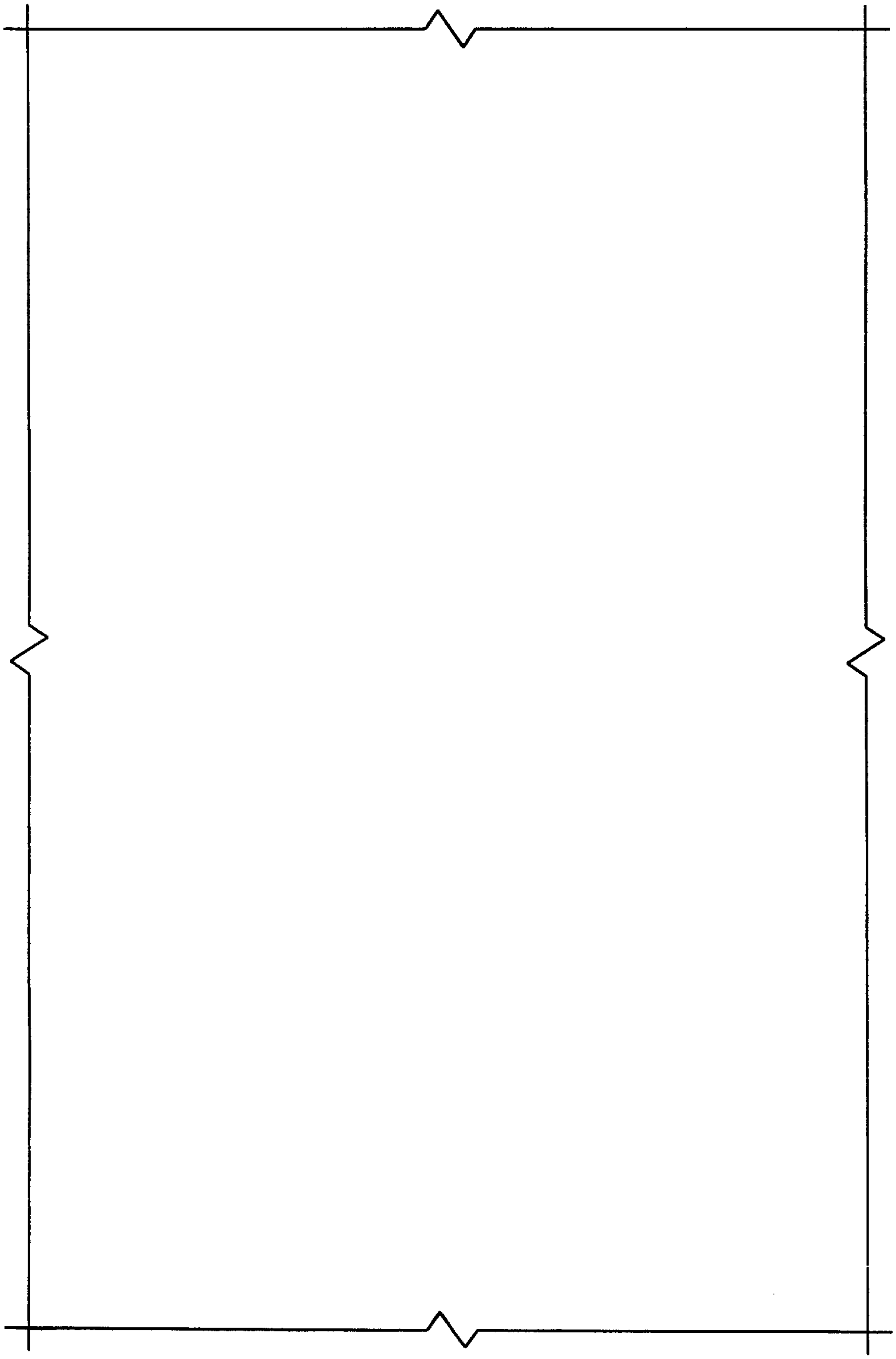
Figure 20E:
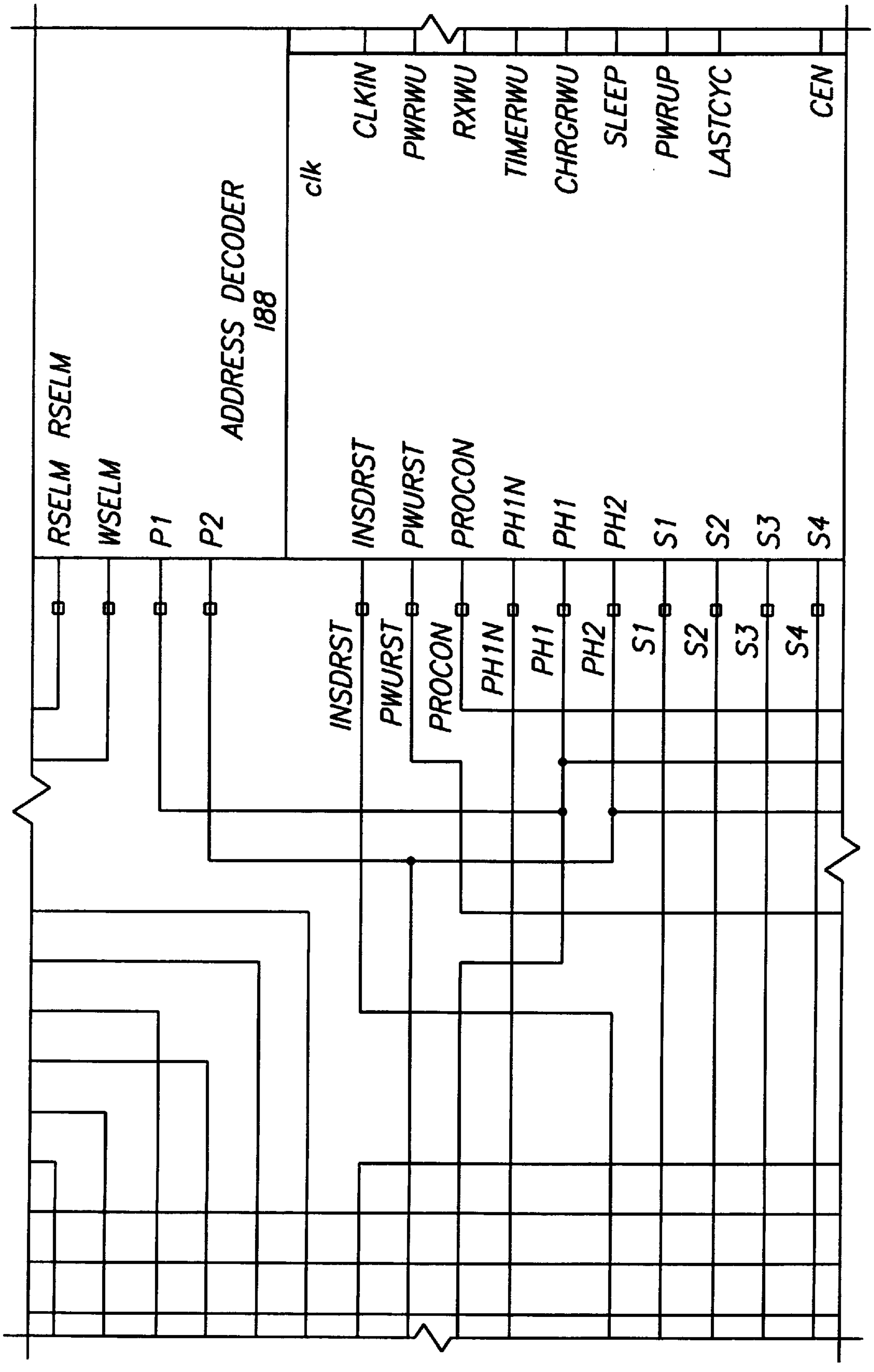
Figure 20E:
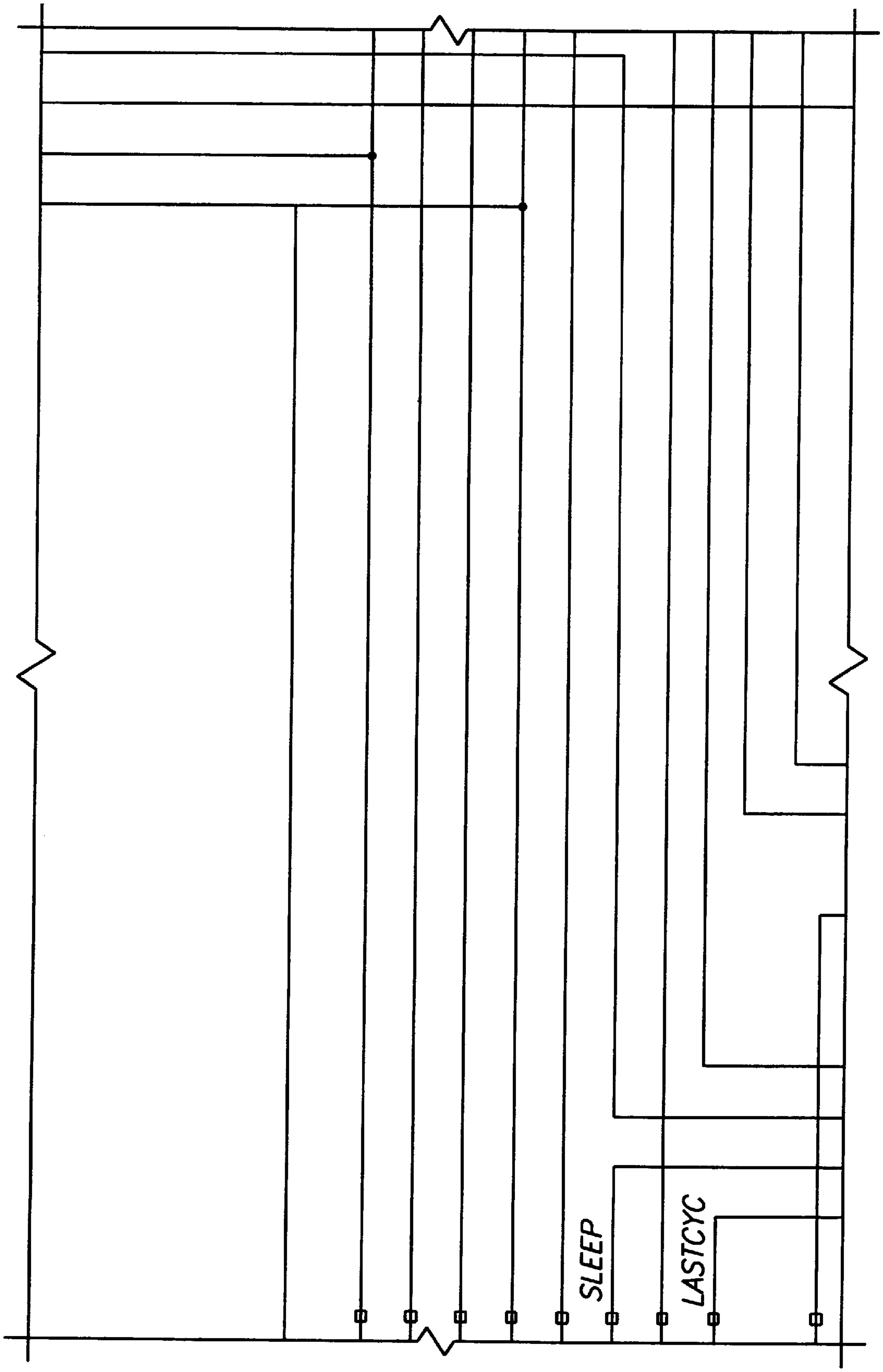
Figure 20E:
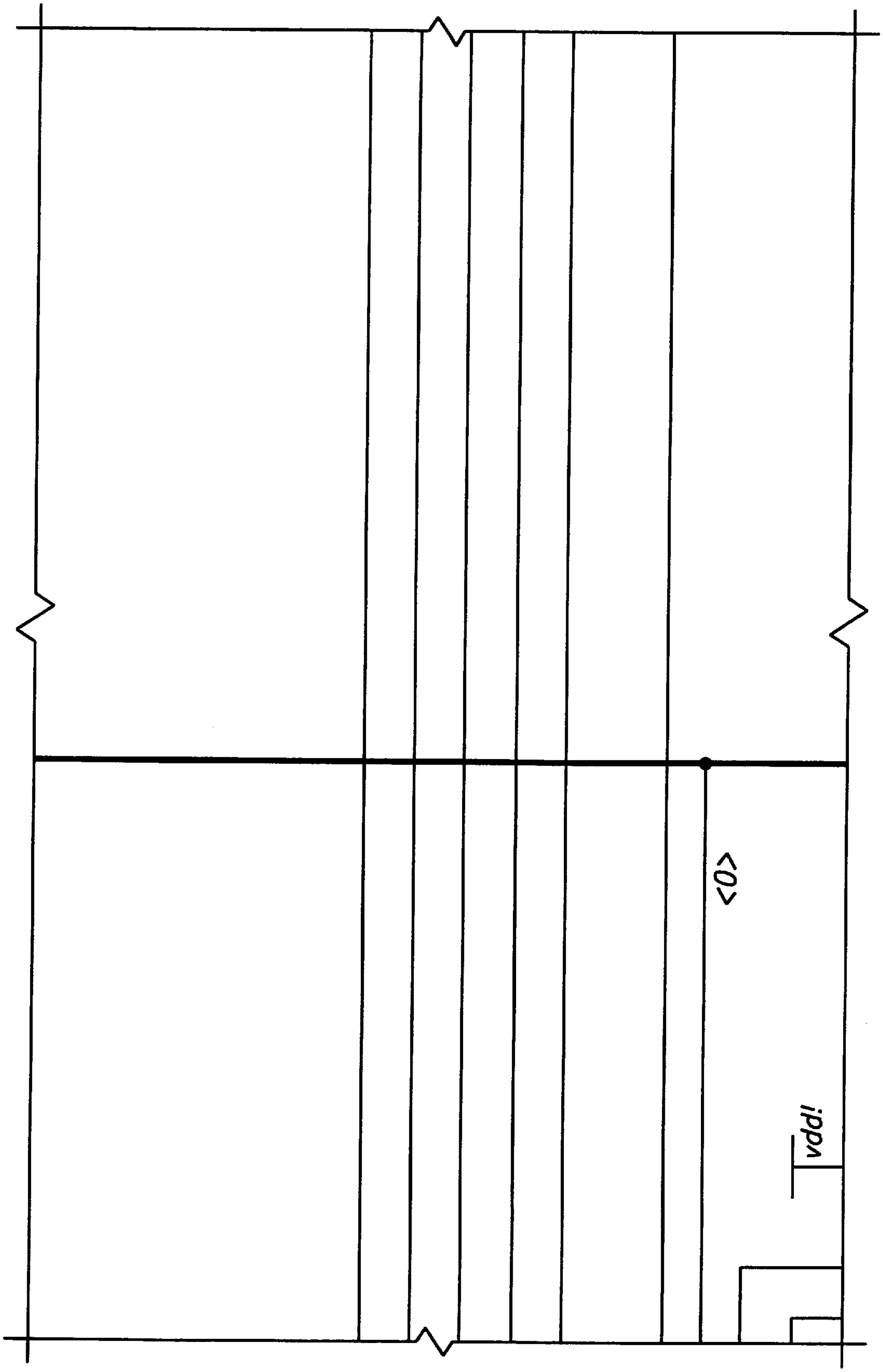
Figure 20E:
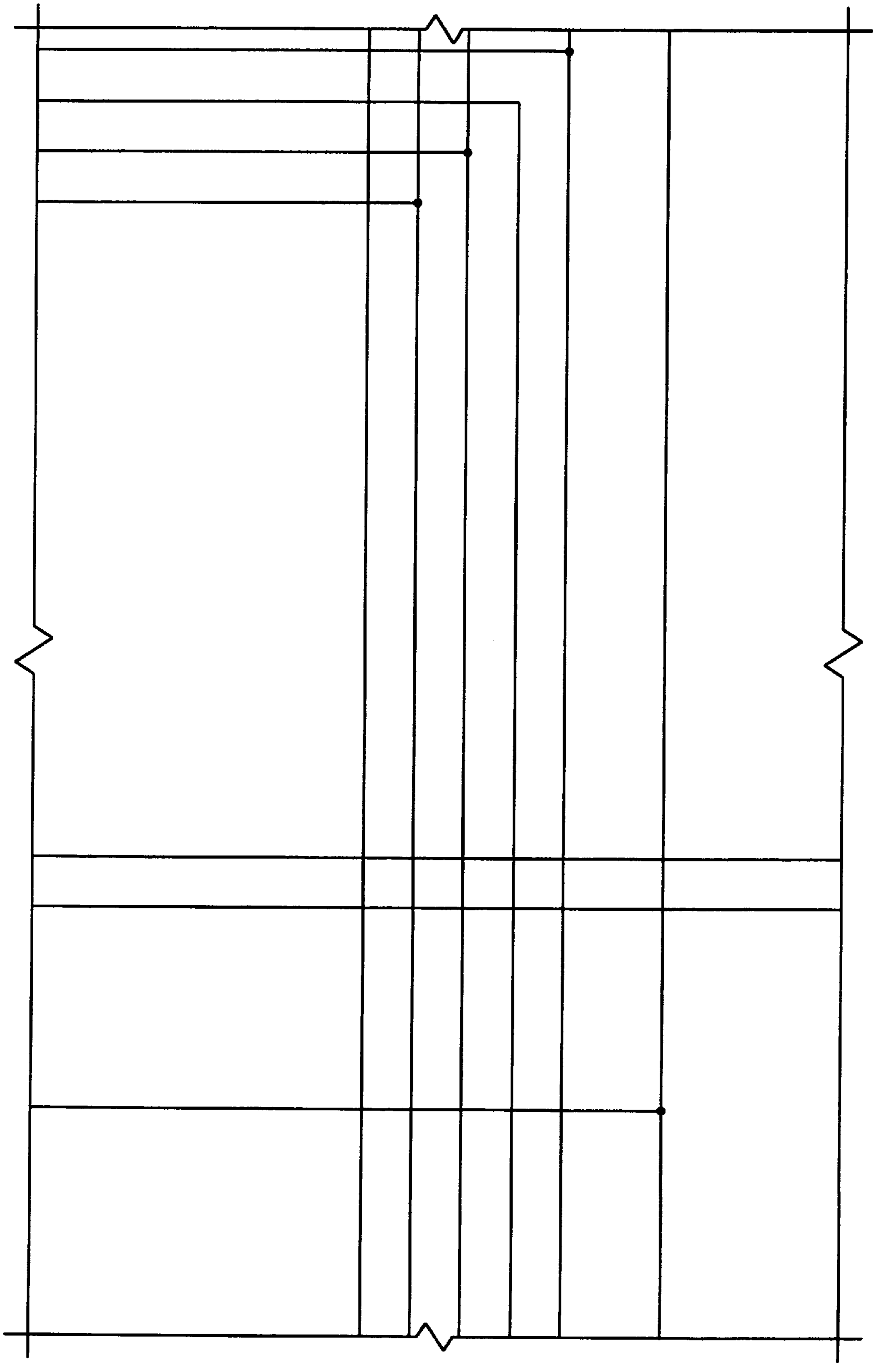
Figure 20E:
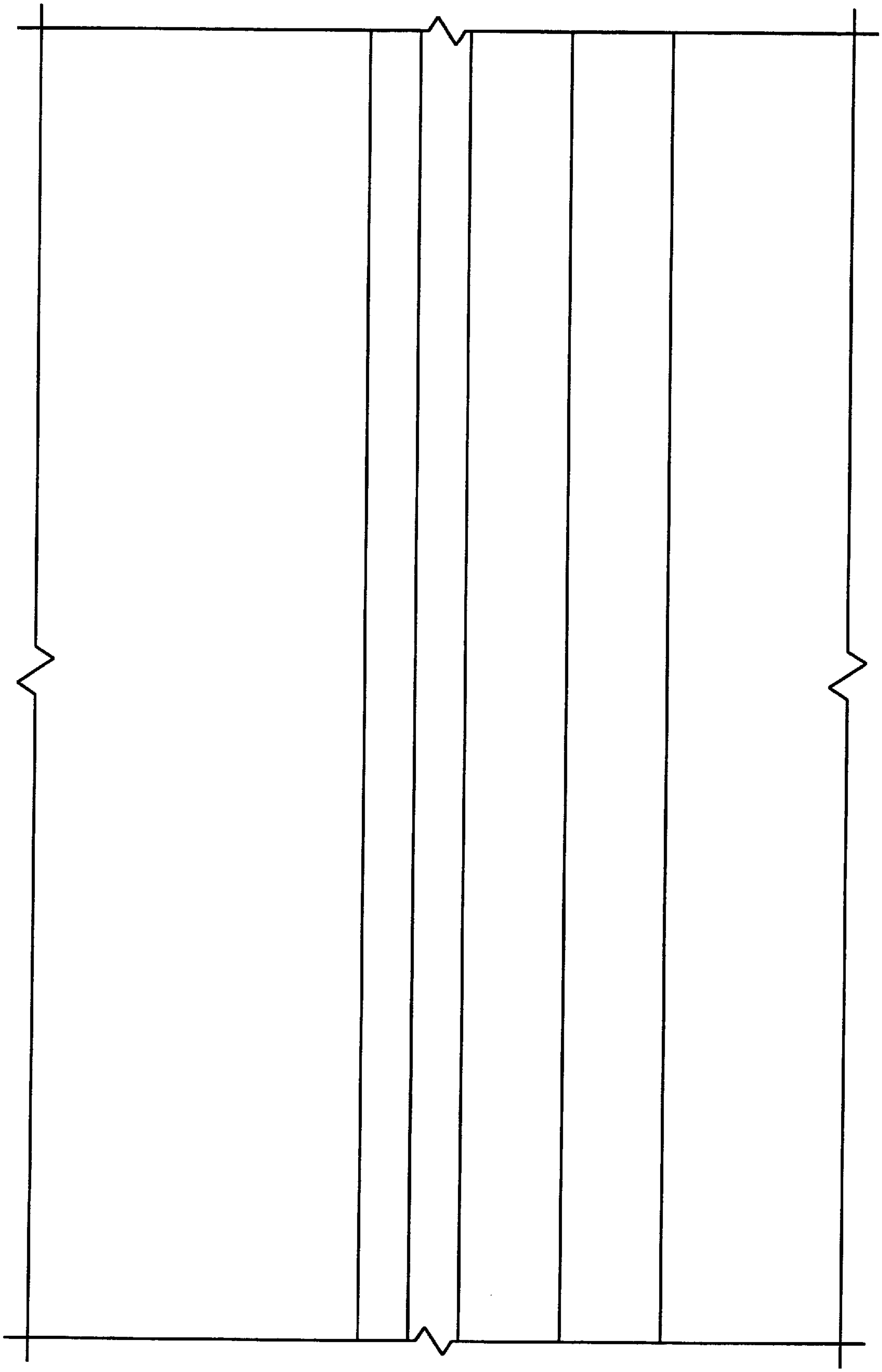
Figure 20E:
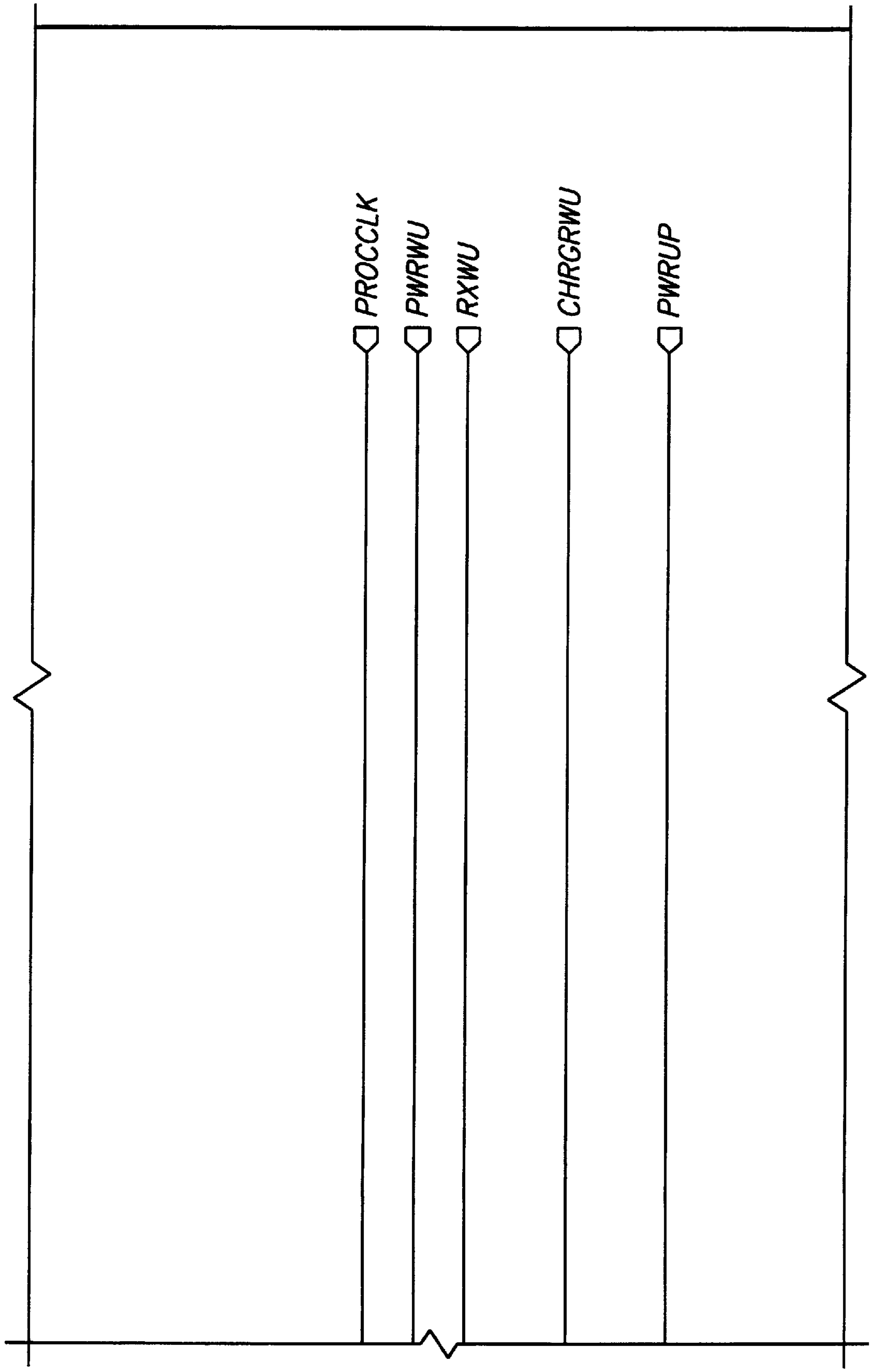
Figure 20F:
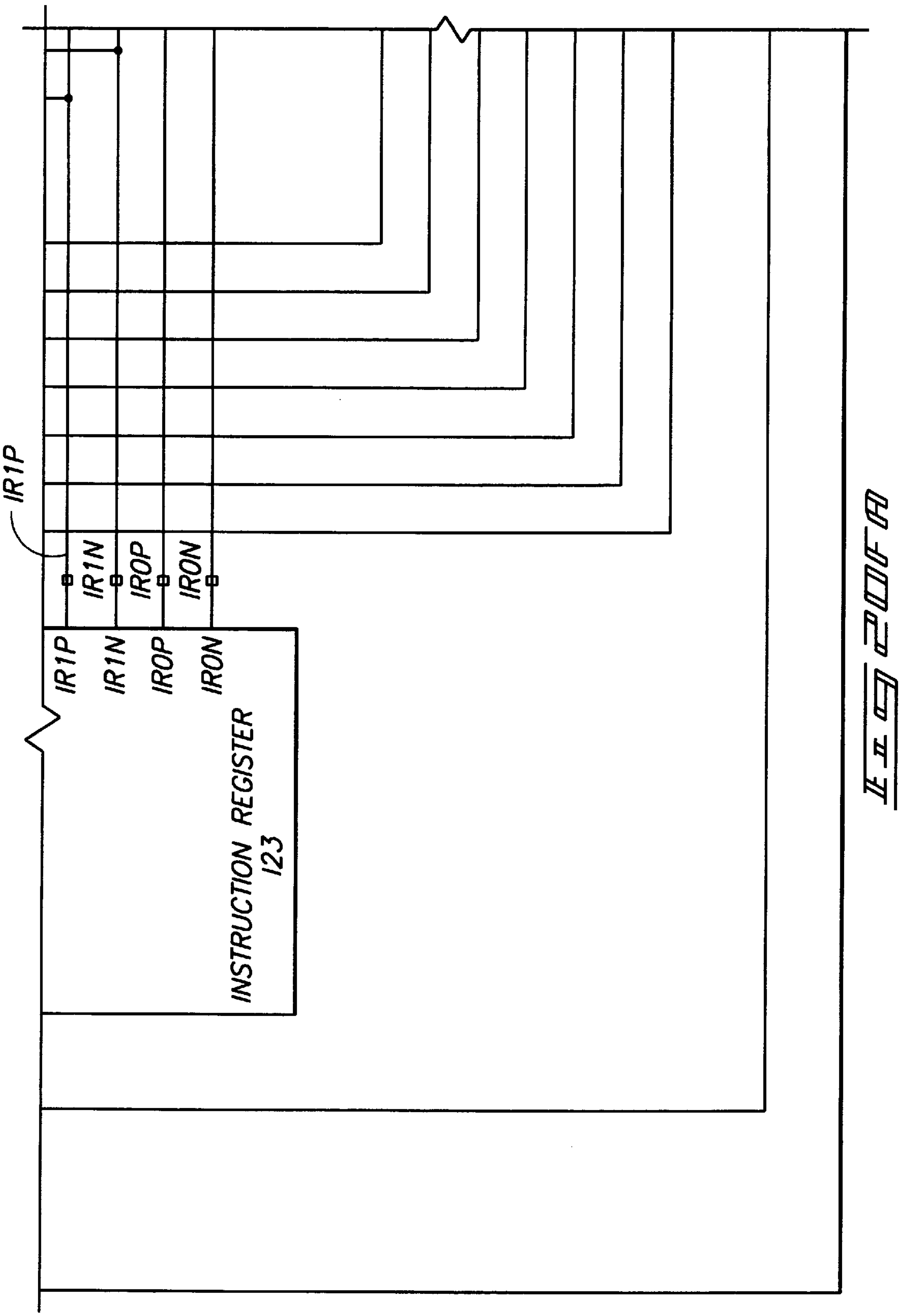
Figure 20F:
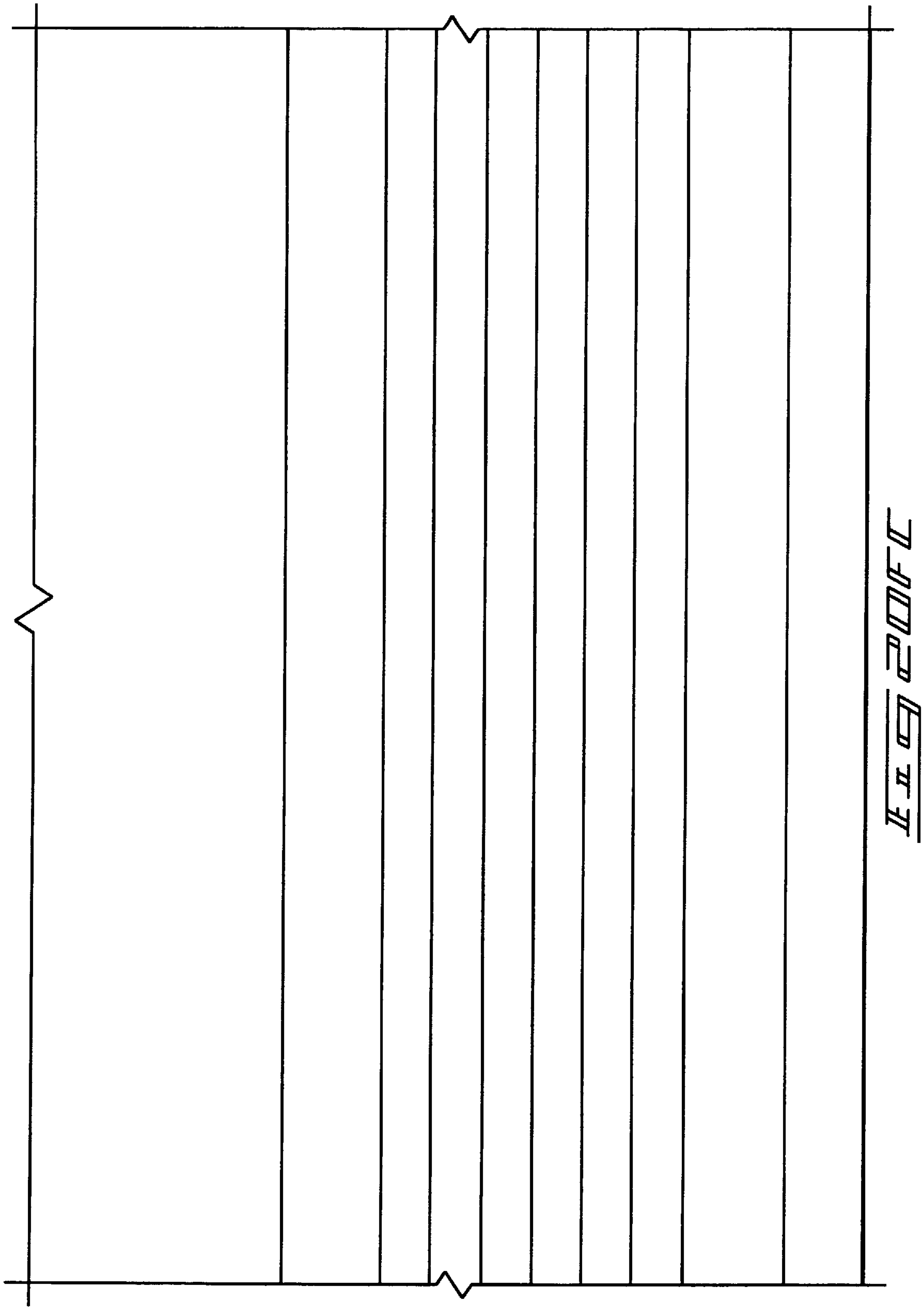
Figure 20F:
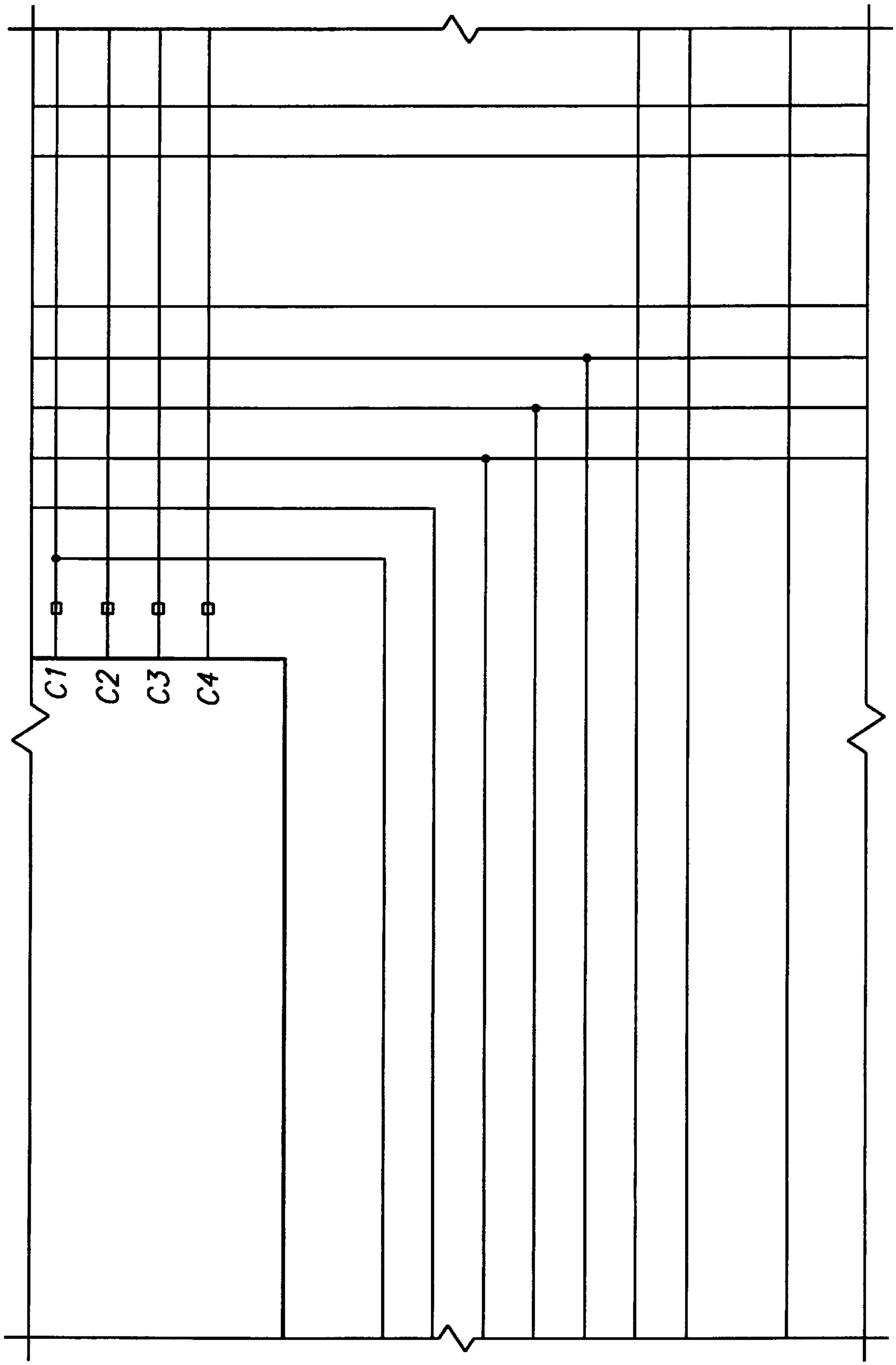
Figure 20F:
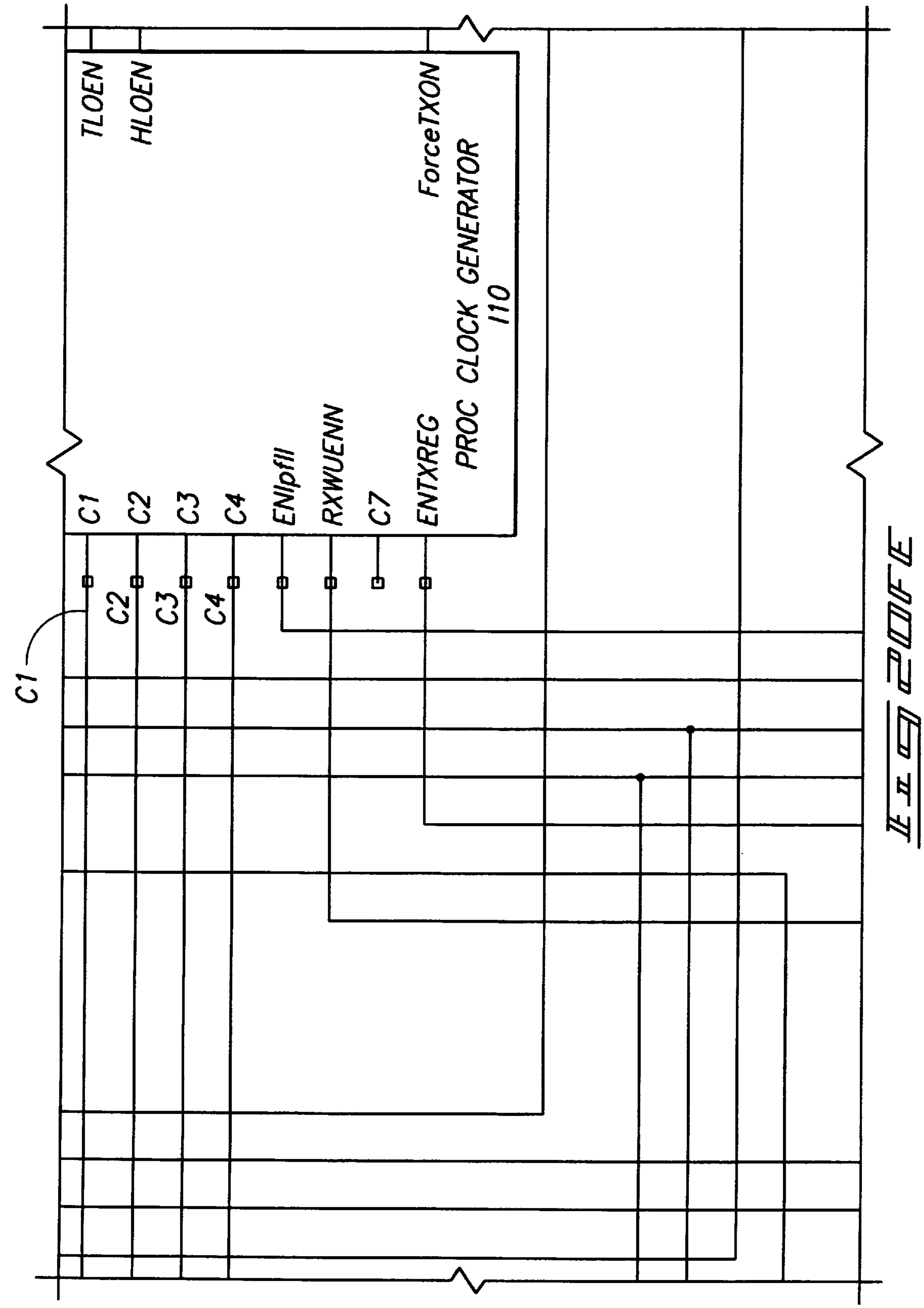
Figure 20F:
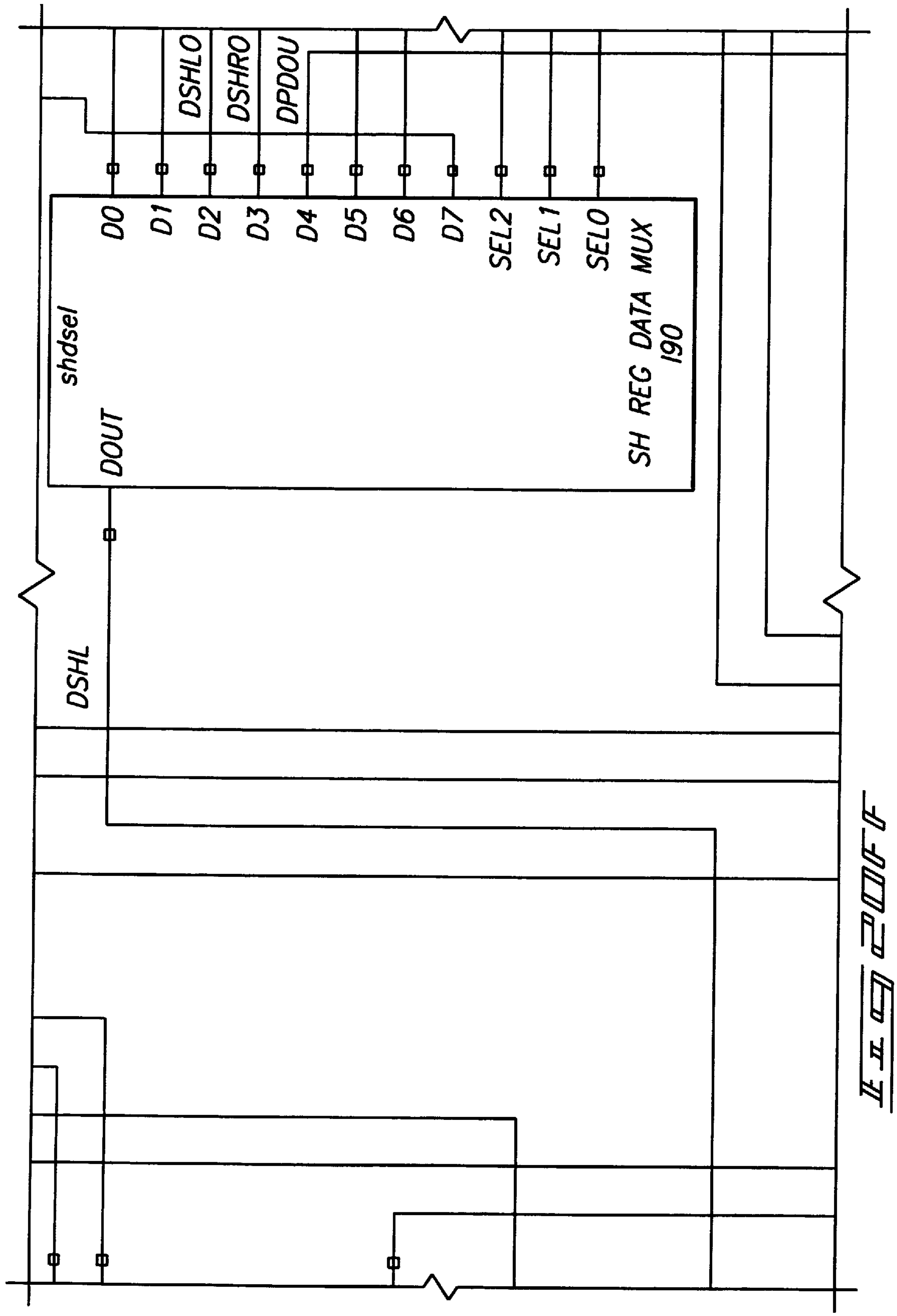
Figure 20F:
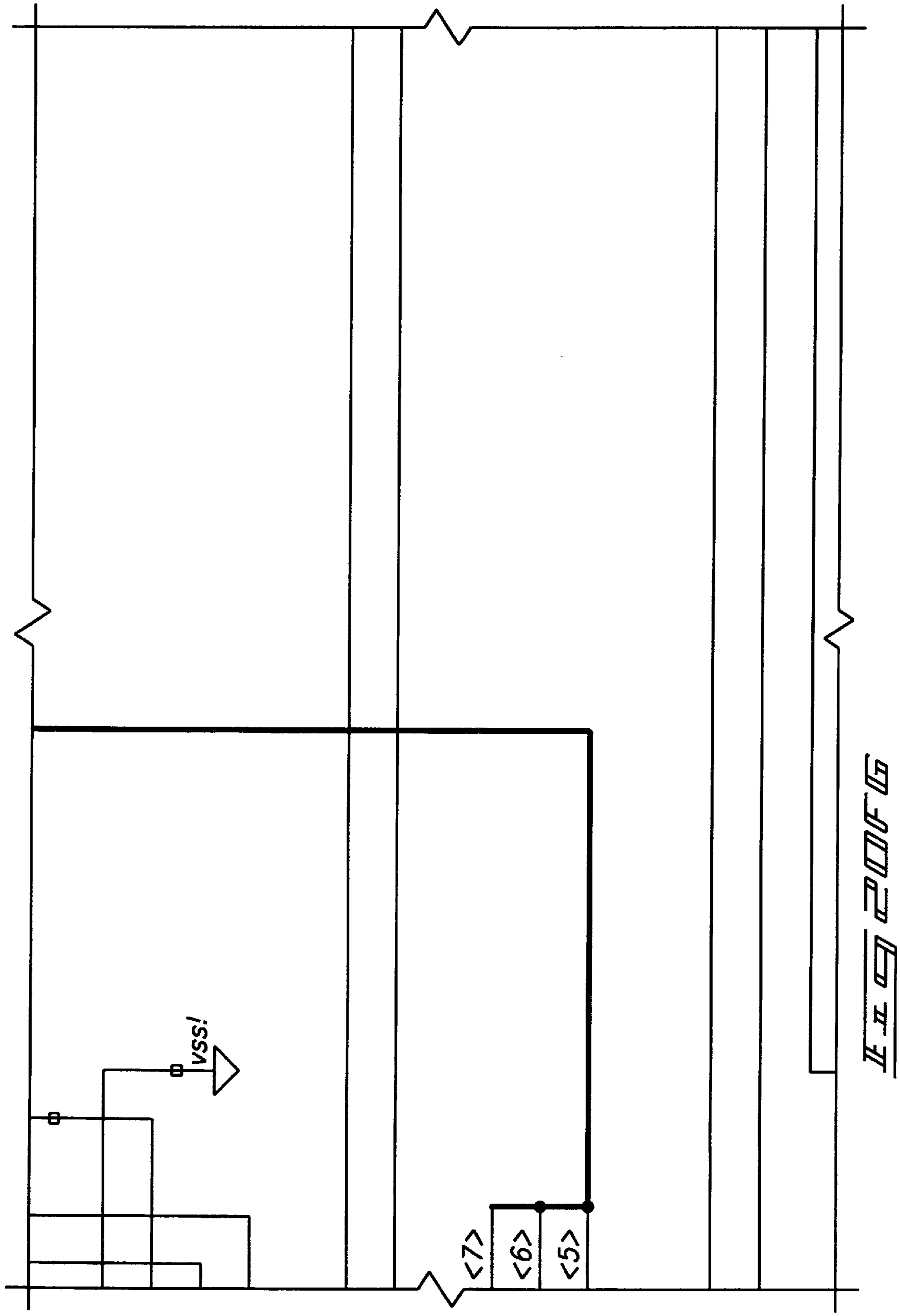
Figure 20F:
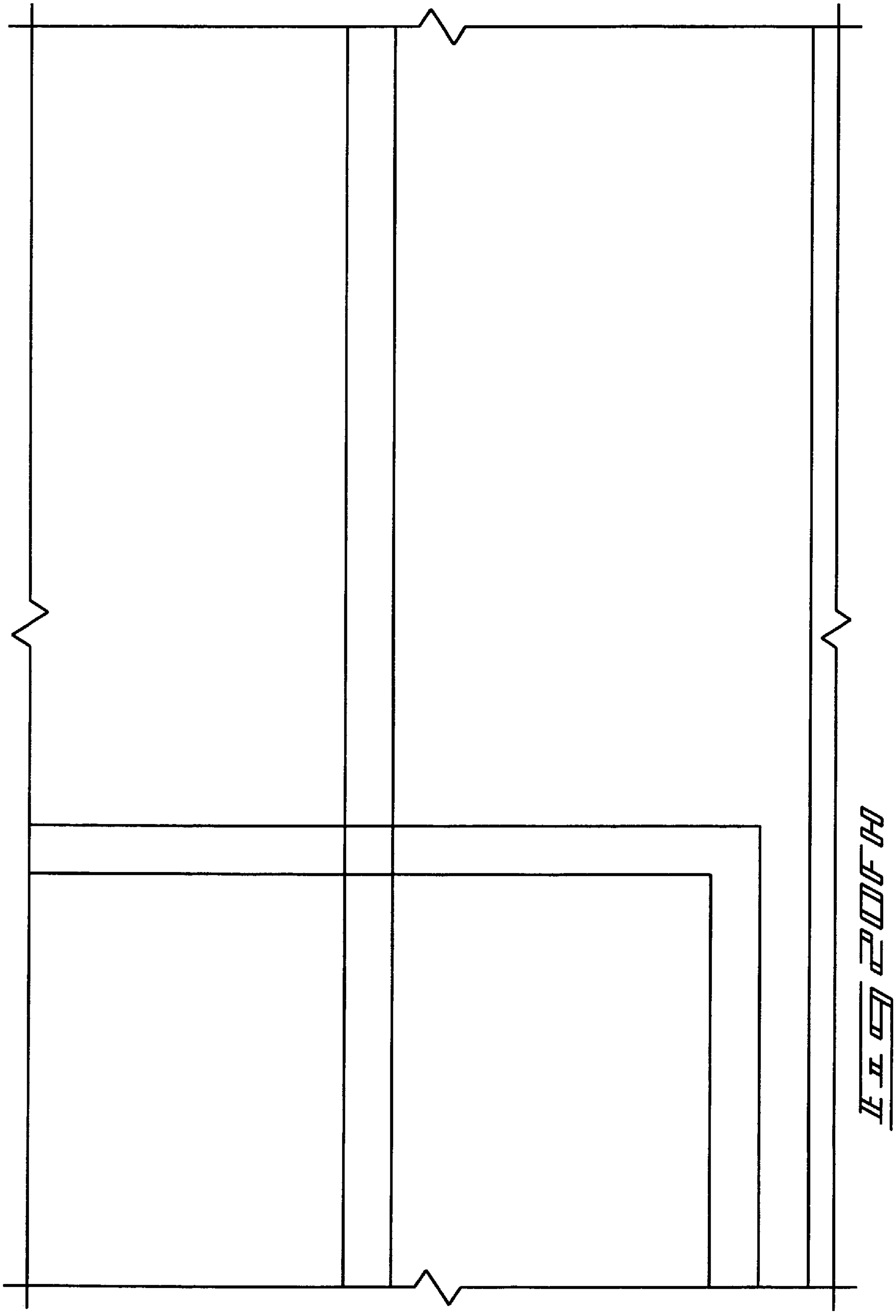
Figure 20F:
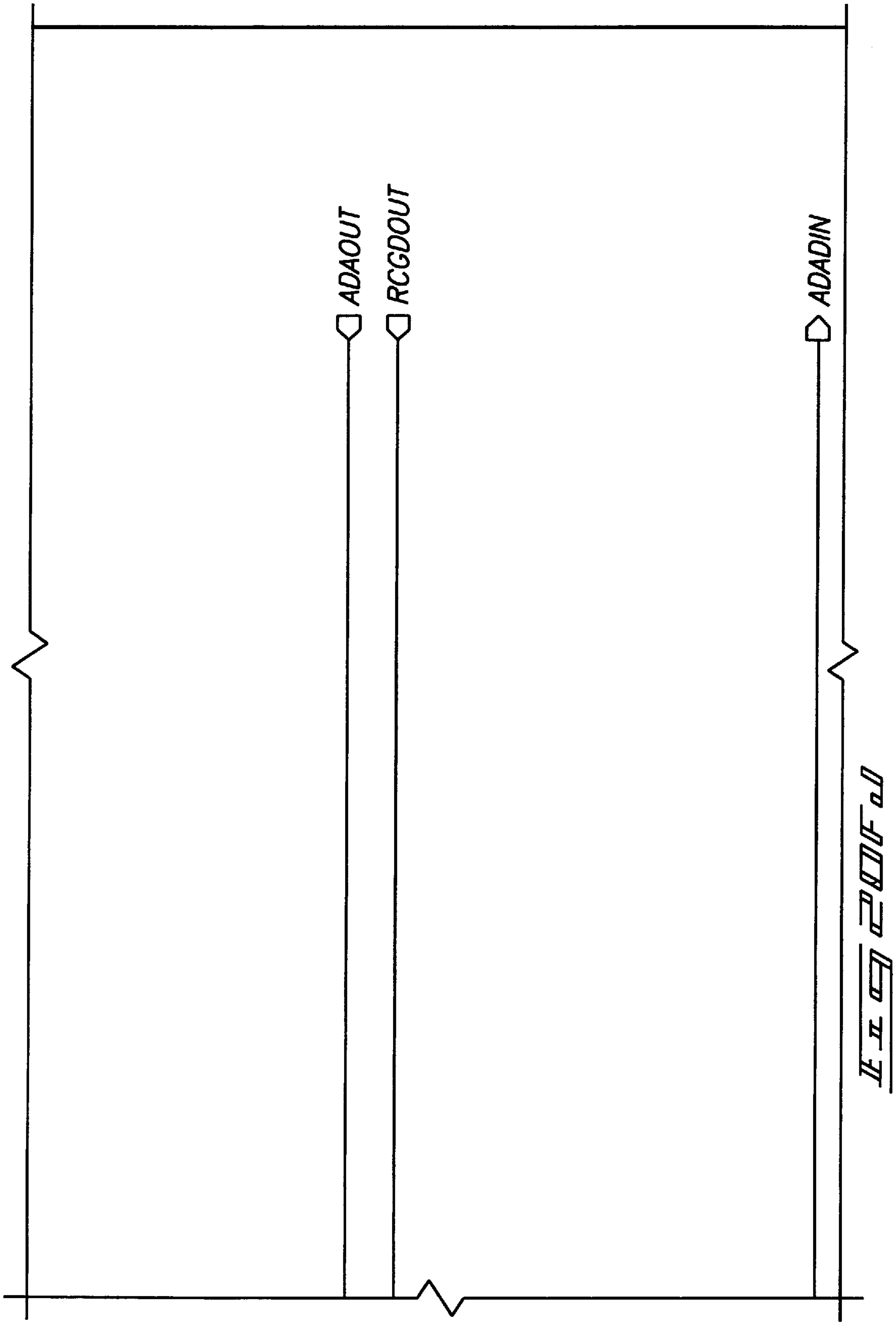
Figure 206D:
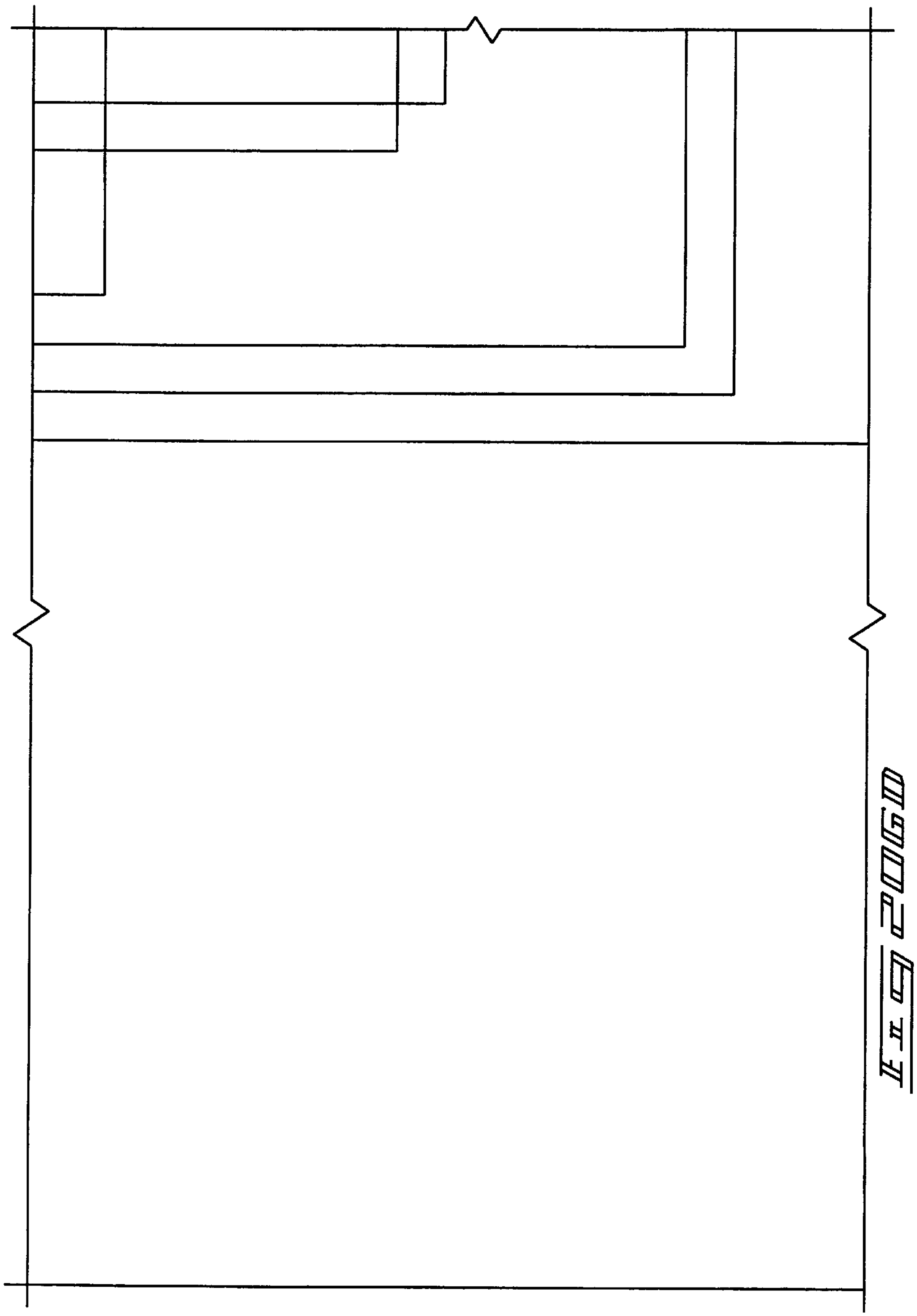
Figure 206E:
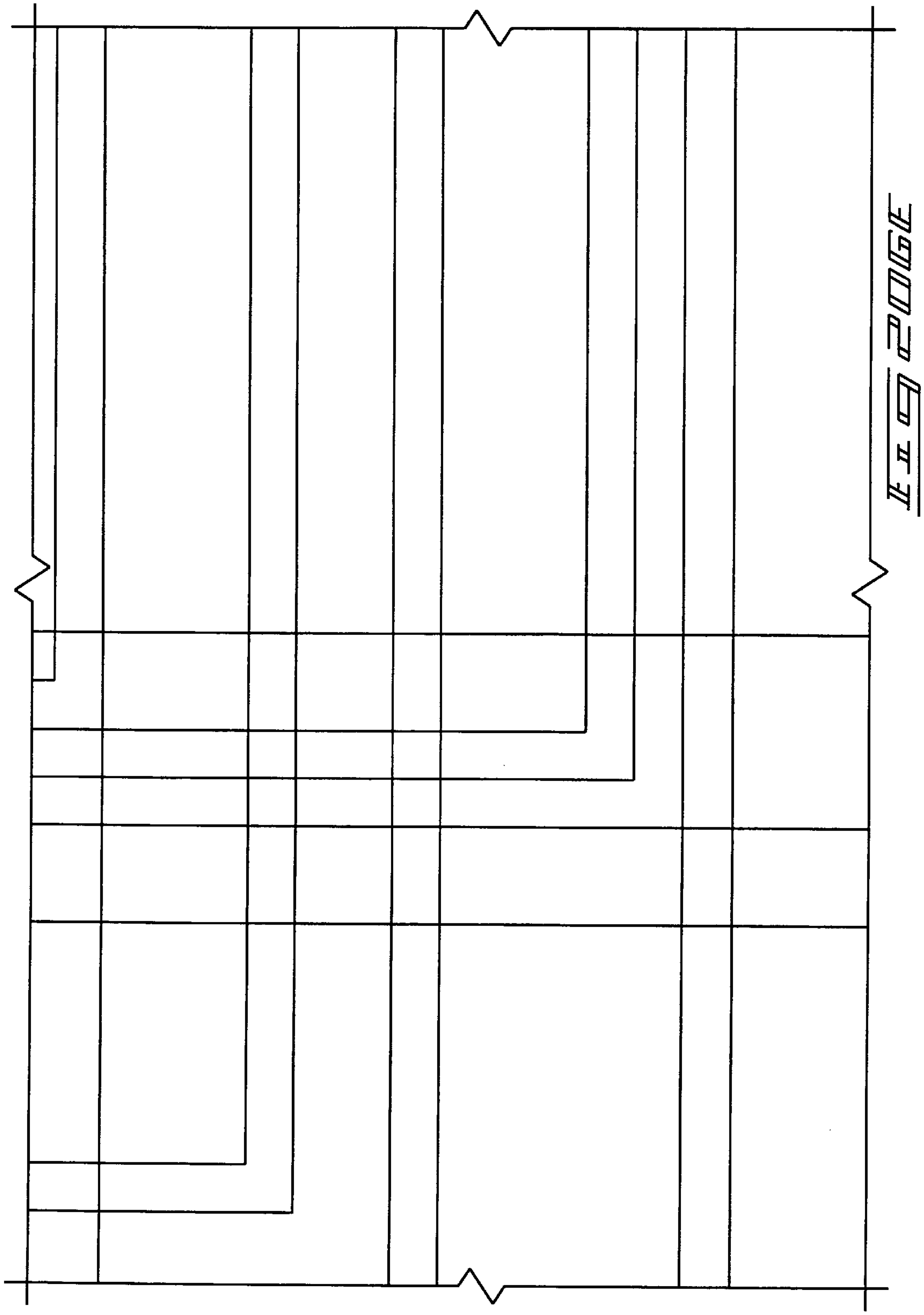
Figure 206F:
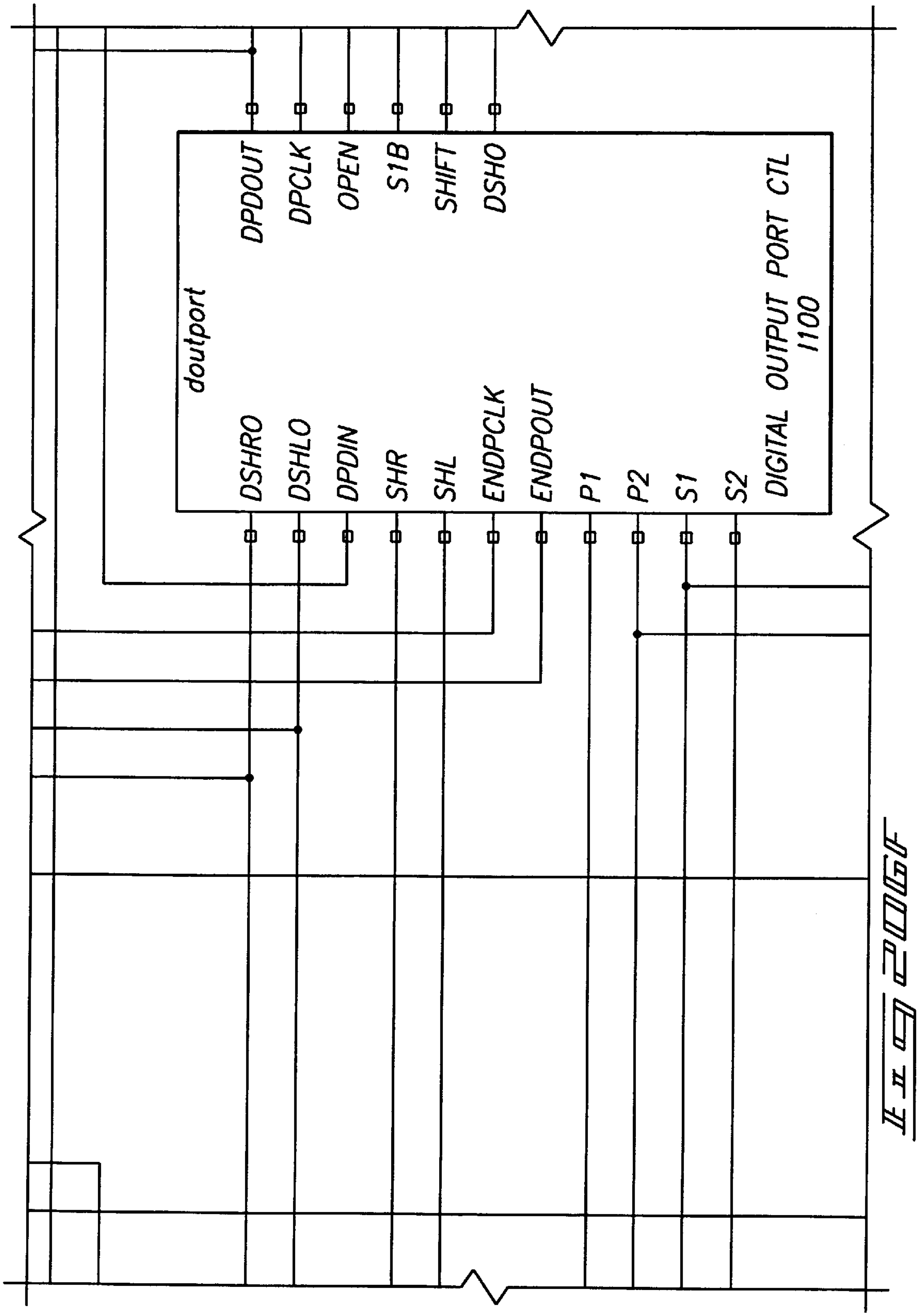
Figure 206G:
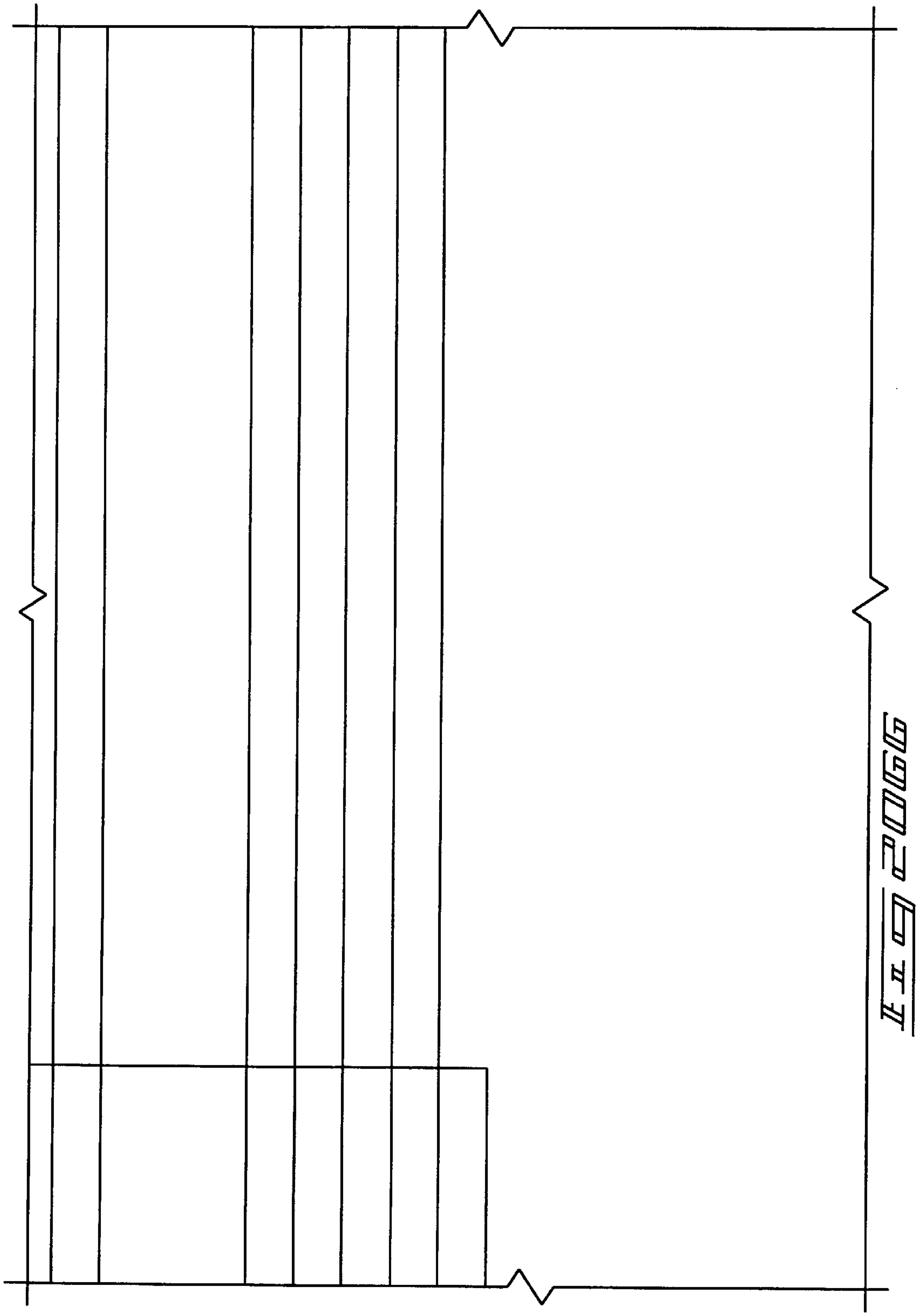
Figure 206I:
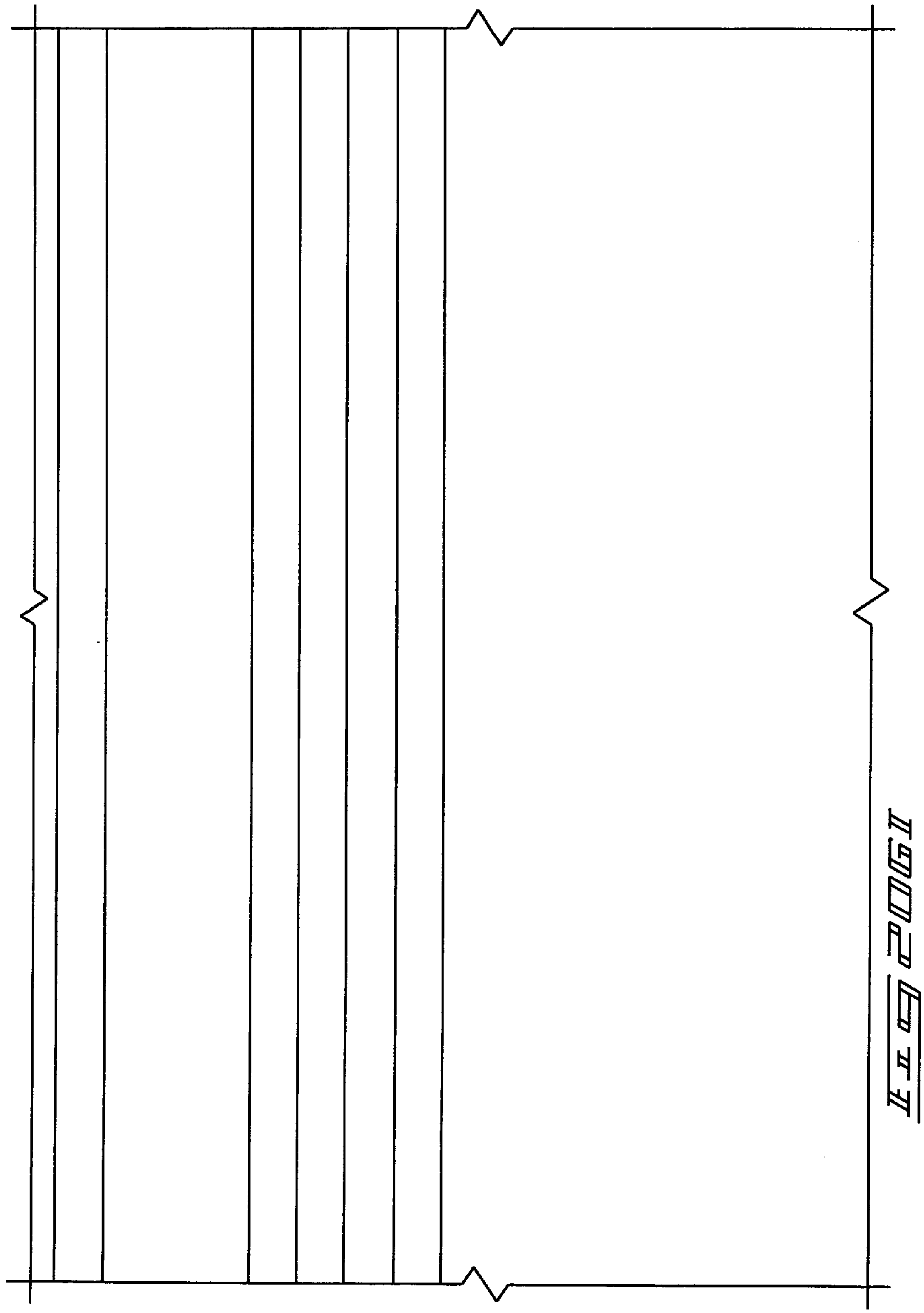
Figure 206J:
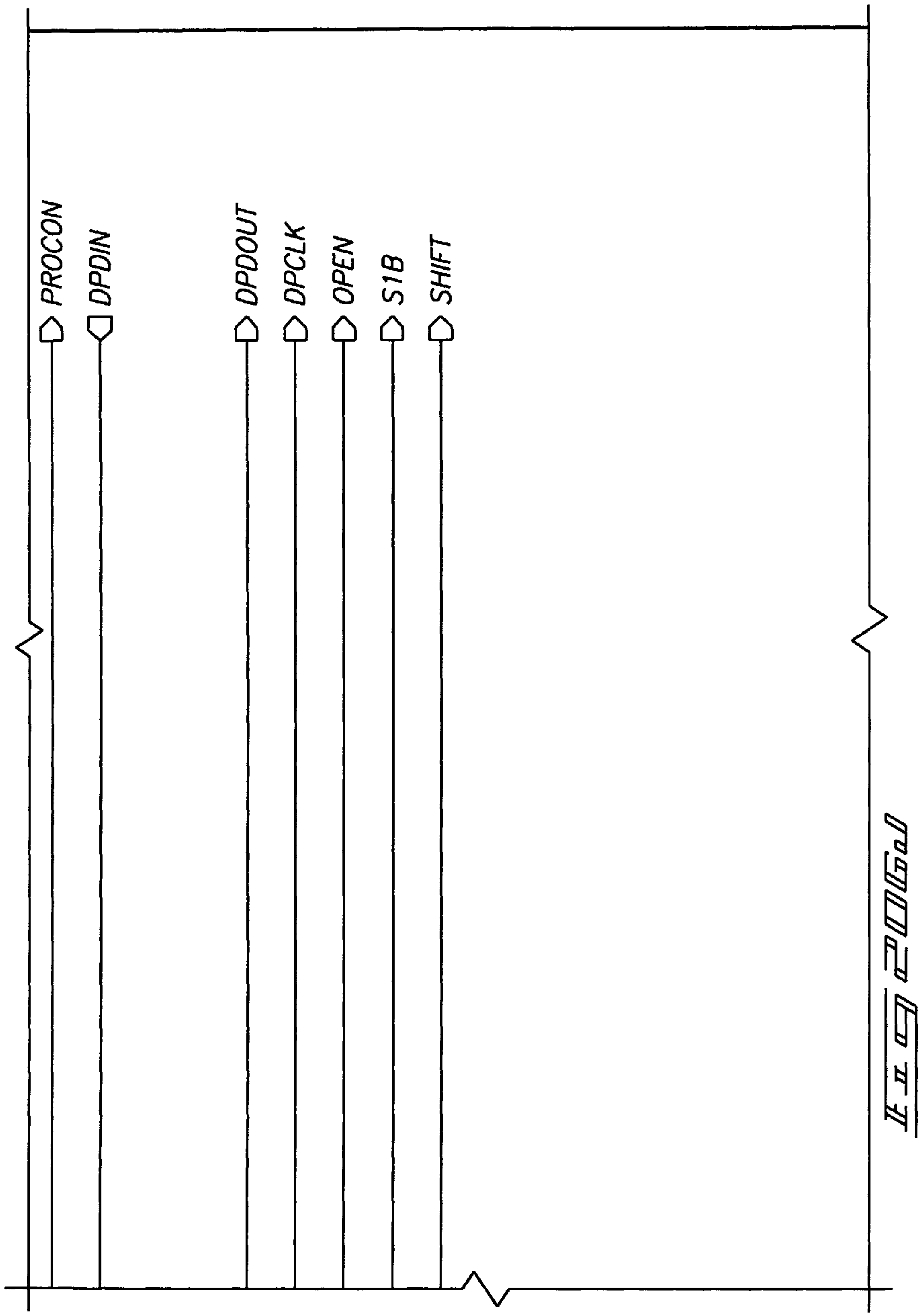
Figure 204D:
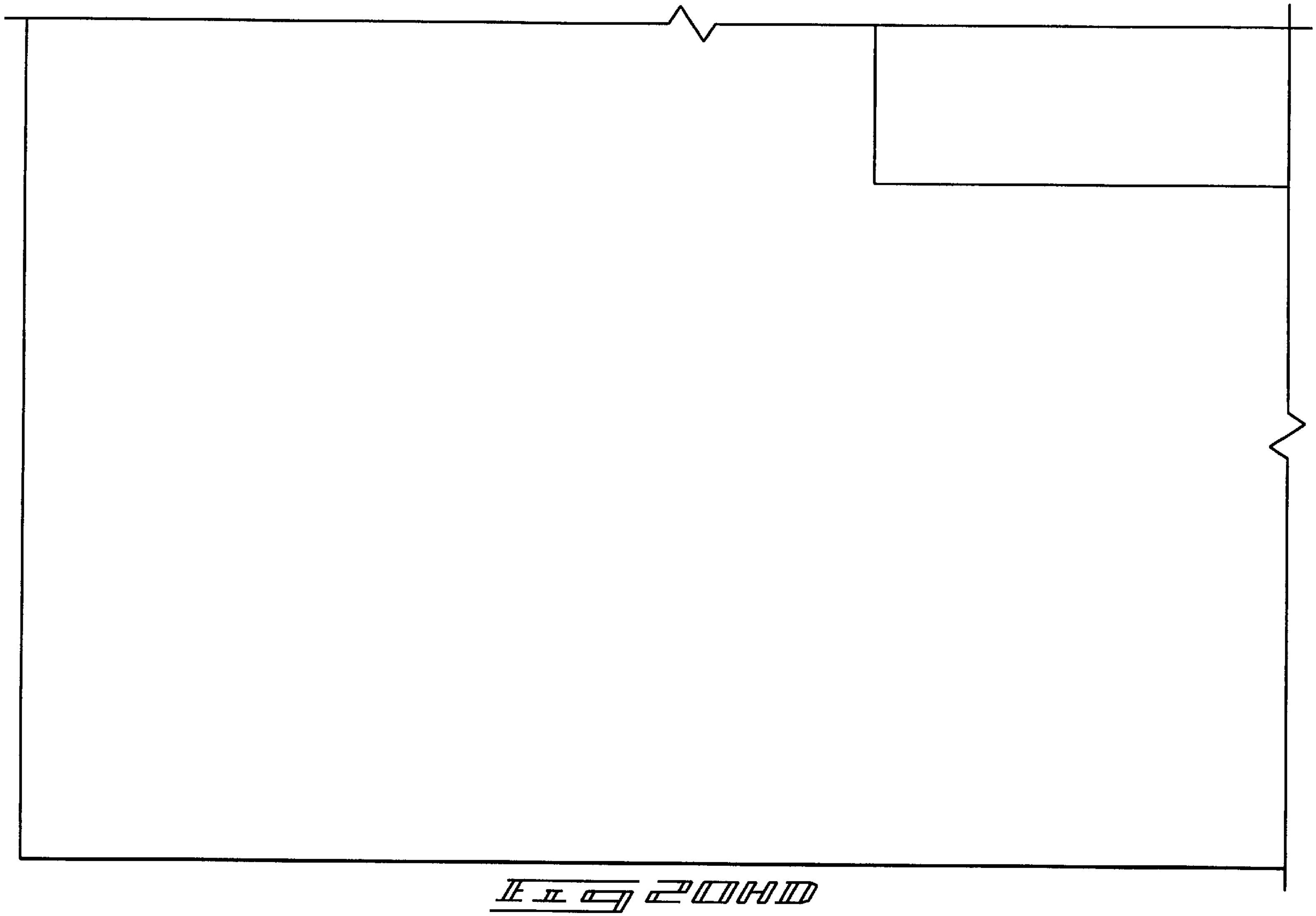
Figure 204E:
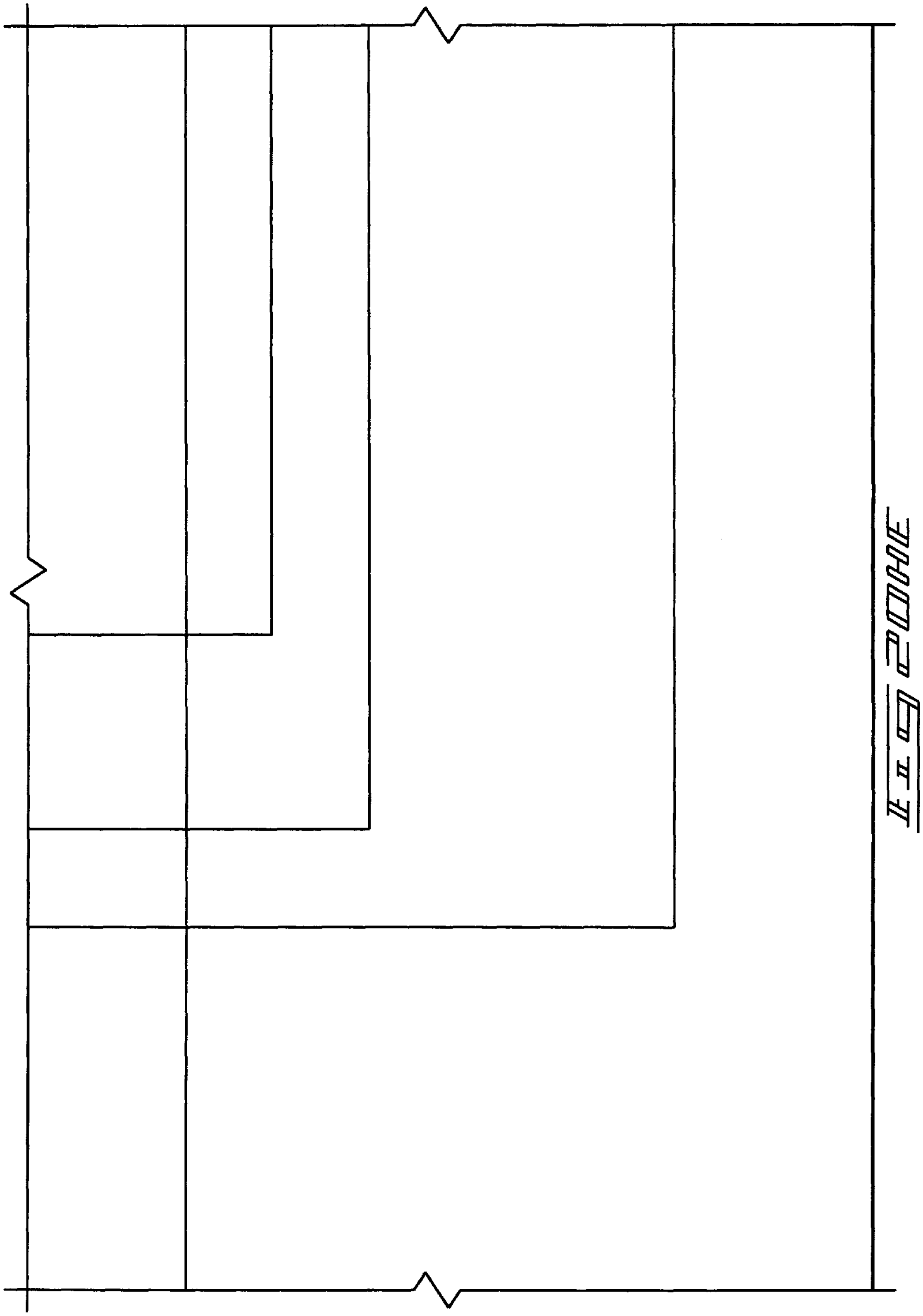
Figure 20H:
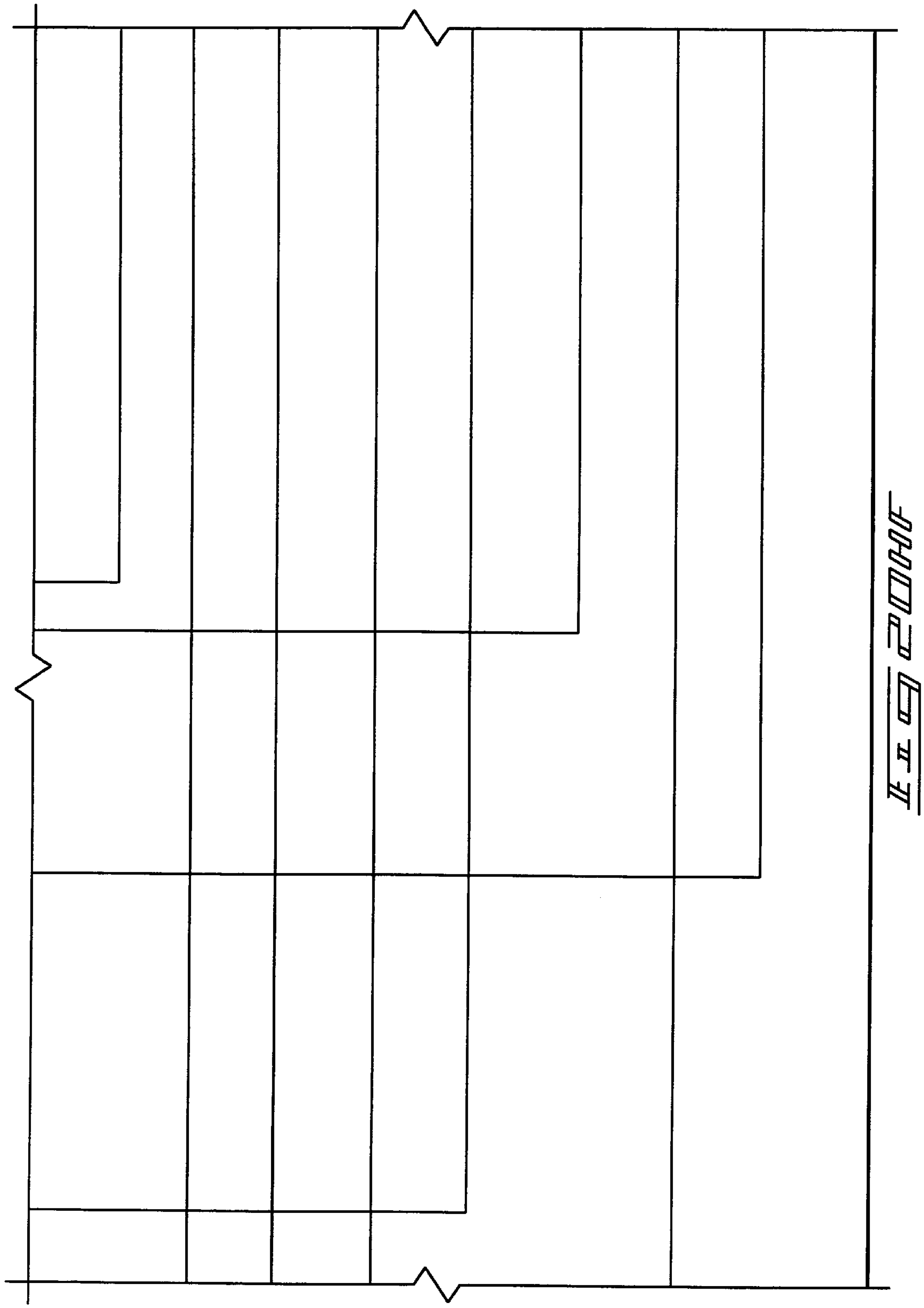
Figure 20K:
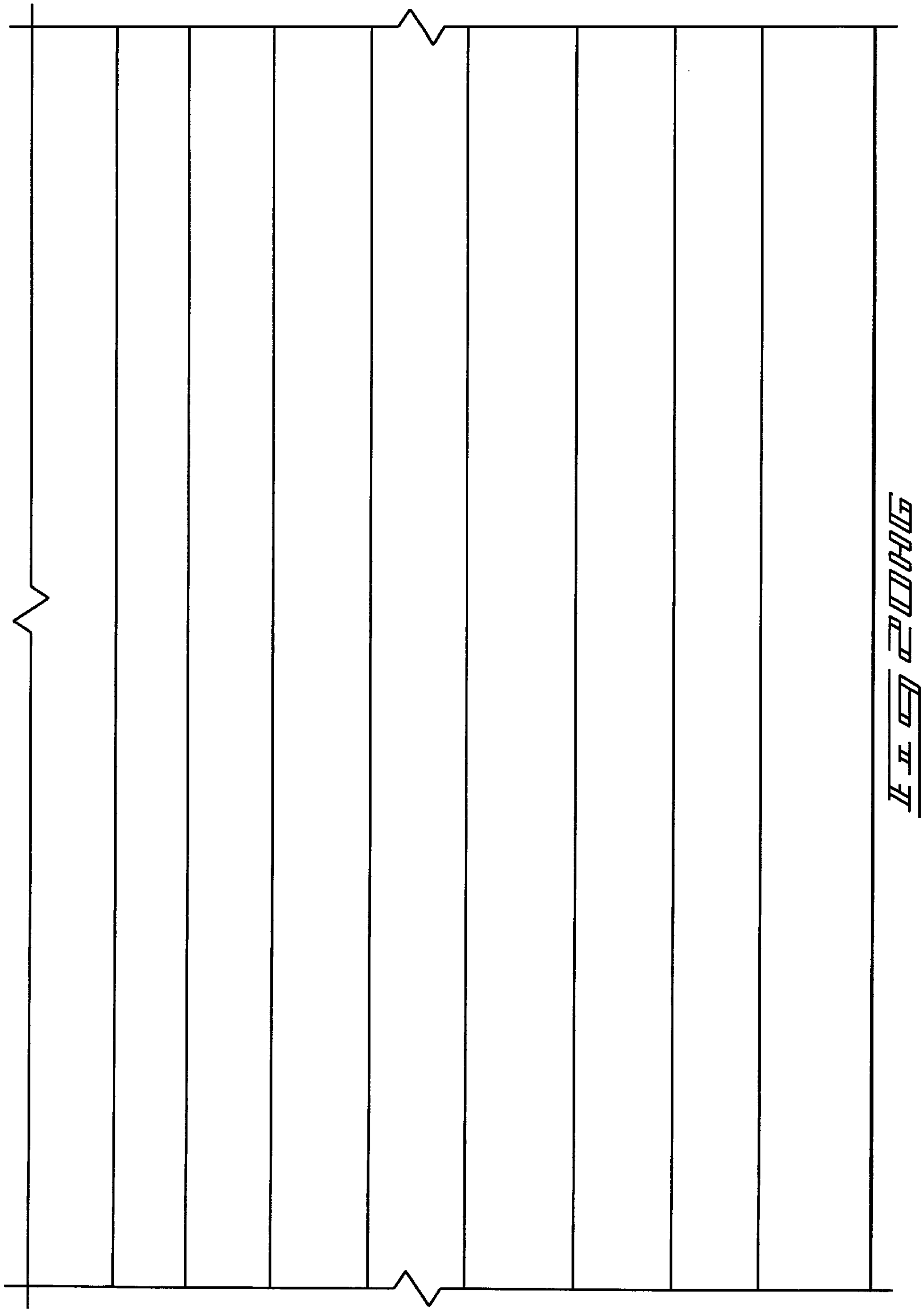
Figure 204I:
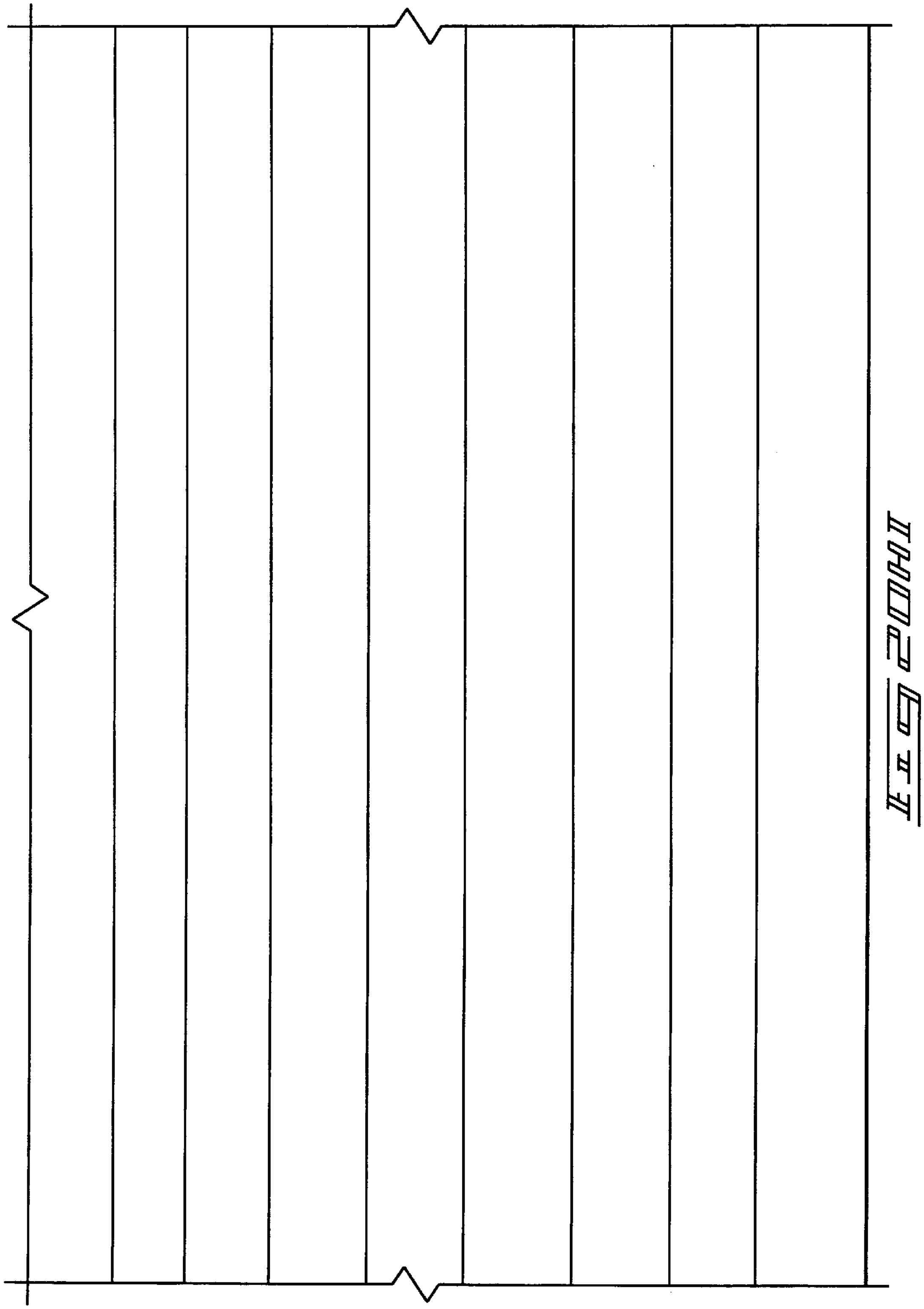

FIG. 20 is a graph illustrating how FIGS. 20AA–DF are to be assembled. After such assembly, FIGS. 20AA–DF provide a circuit drawing of a data processor "dataproct3" to be used in the integrated circuit of FIG. 19 in place of the data processor "dataproc" of FIG. 7.

FIG. 20.01 is a graph illustrating how FIGS. 20.01AA–CB are to be assembled. After such assembly, FIGS. 20.01AA–CB provide a circuit drawing of an external ROM "extrom" shown in FIGS. 20AA–CB.

FIG. 20.0101 is a graph illustrating how FIGS. 20.0101AA–BB are to be assembled. After such assembly, FIGS. 20.0101AA–BB provide a circuit drawing of external ROM control logic nextromctl" included in the circuit of FIGS. 20.01AA–CB.

FIG. 20.0102 is a circuit drawing of an external ROM address interface "extromad" included in the circuit of FIGS. 20.01AA–CB.

FIG. 20.0103 is a graph illustrating how FIGS. 20.0103AA–AC are to be assembled. After such assembly, FIGS. 20.0103AA–AC provide a circuit drawing of a digital I/O pad buffer "paddigt3" included in the circuit of FIGS. 20.01AA–CB.

FIG. 20.0104 is a circuit drawing of an external ROM databus interface "extromdb" included in the circuit of FIGS. 20.01AA–CB.

Figure 21:
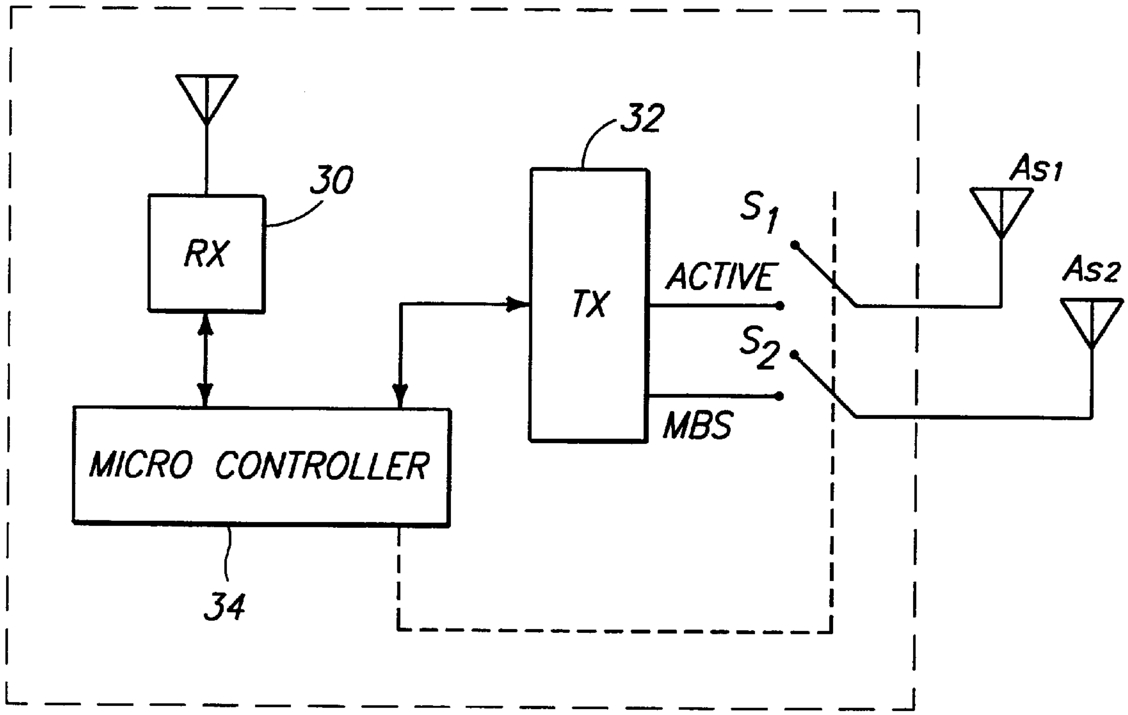

FIG. 21 is a circuit schematic illustrating a transmitter switchable between an active mode and a backscatter mode, and employing separate antennas for the active mode and the backscatter mode.

Figure 22:
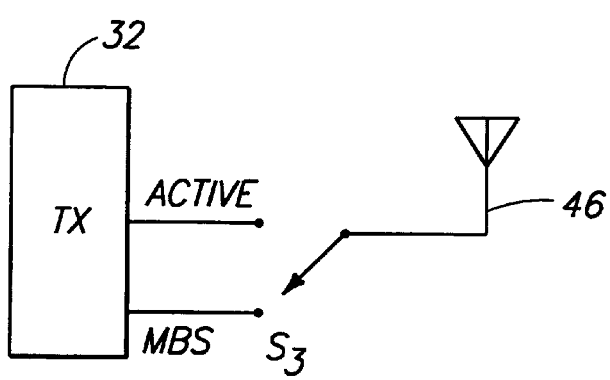

FIG. 22 is a circuit schematic illustrating a transmitter switchable between an active mode and a backscatter mode, and employing the same antenna for both the active mode and the backscatter mode.

Figure 23:
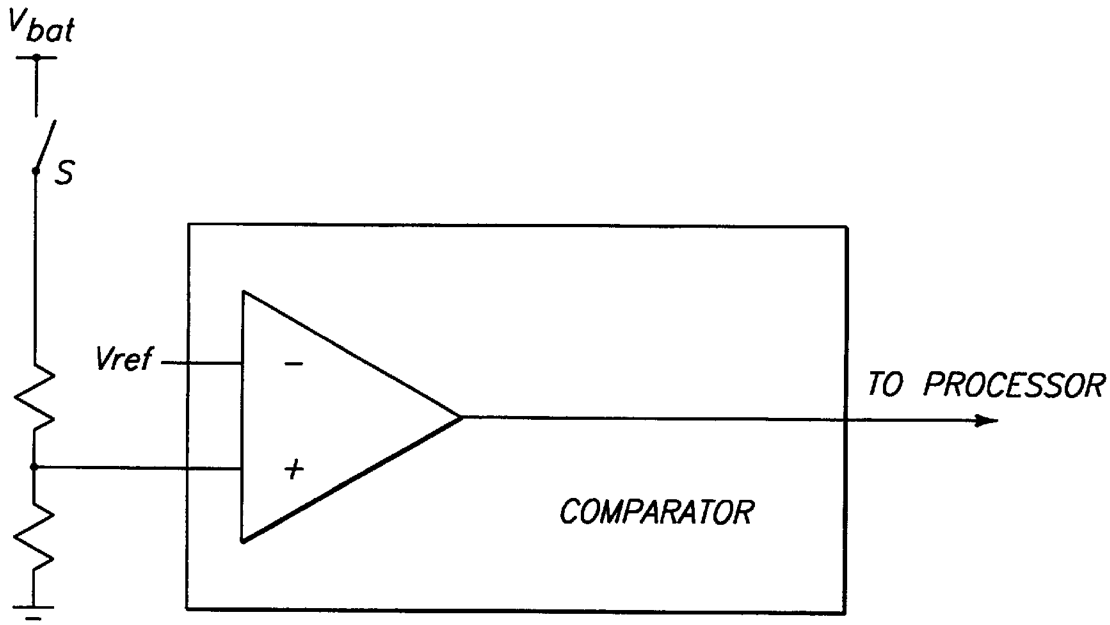

FIG. 23 is a circuit schematic illustrating low battery detection circuitry.

Figure 24:
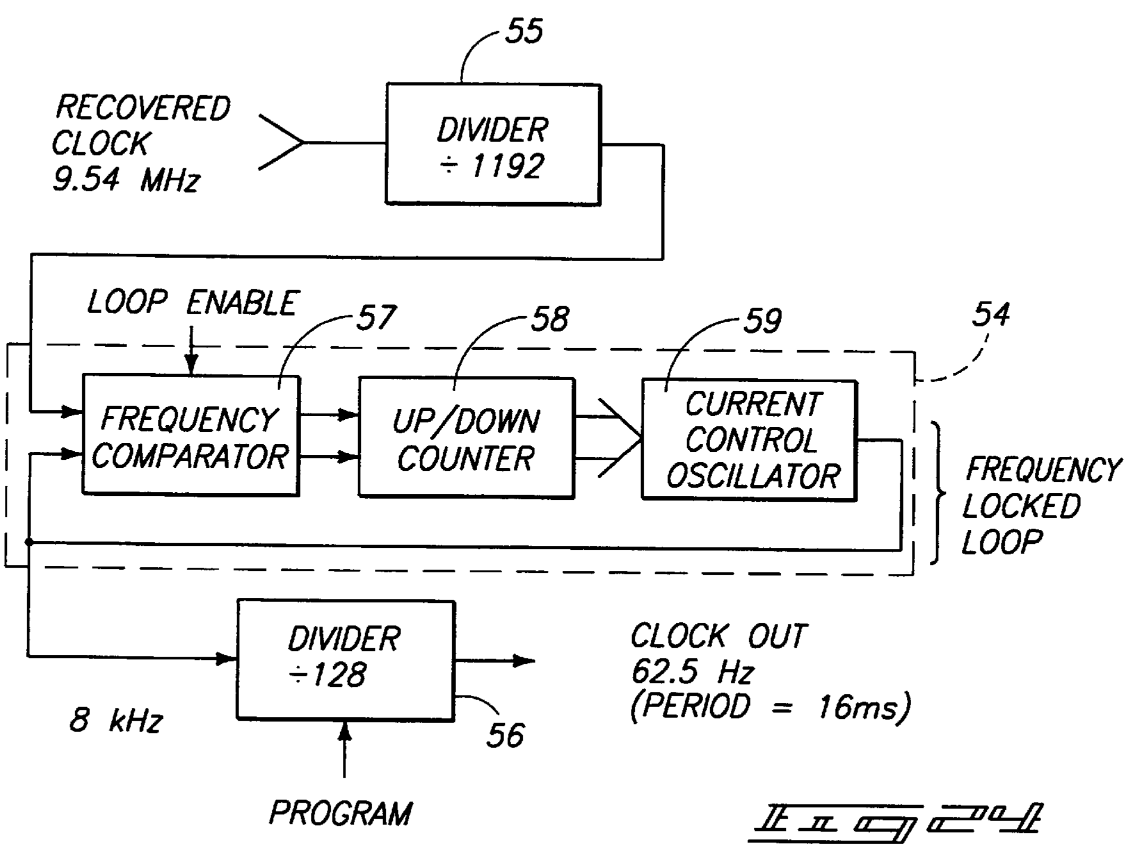

FIG. 24 is a circuit schematic illustrating circuitry providing a low power wake up timer.

Figure 25:
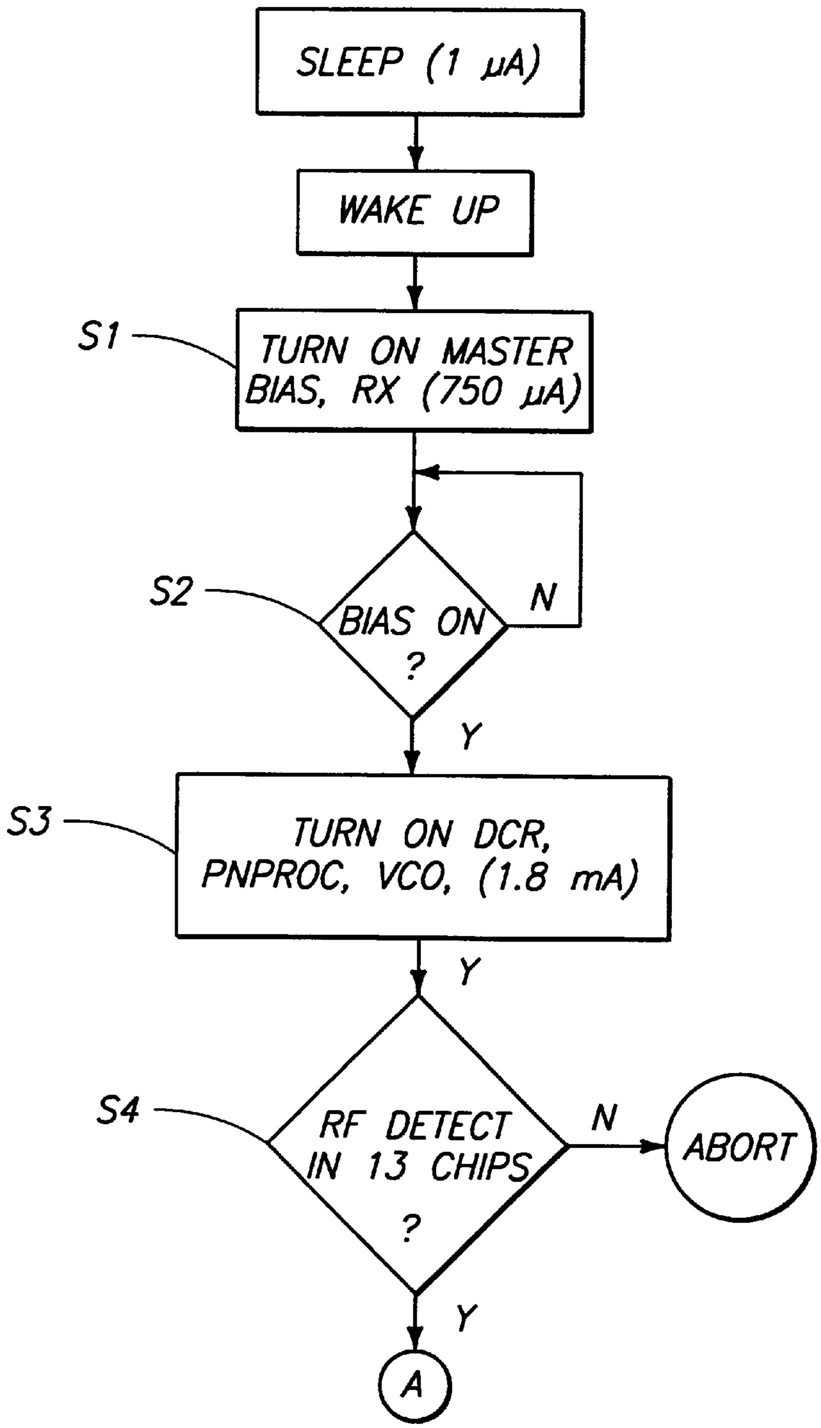
Figure 26:
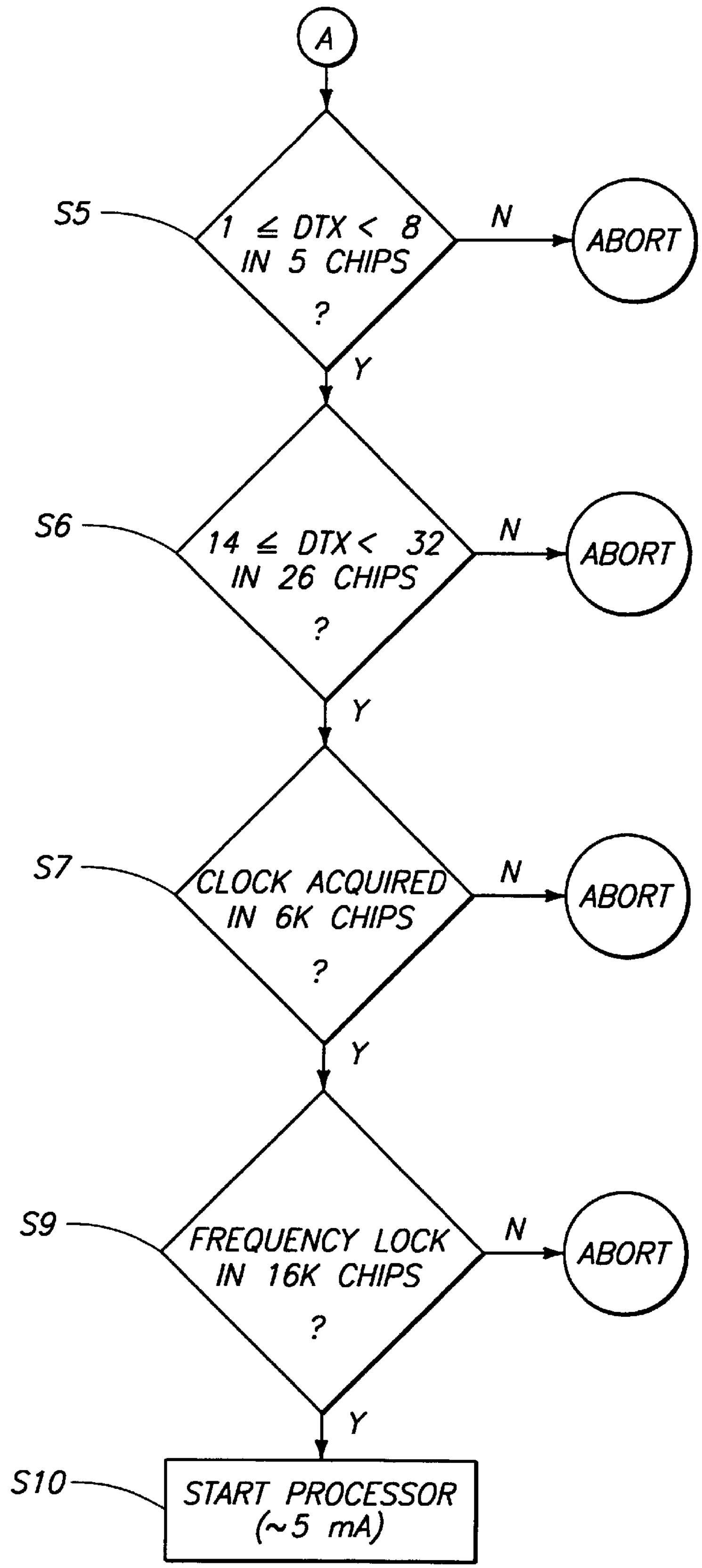

FIGS. 25–26 provide a flowchart illustrating logic employed for switching between a low power sleep mode, and higher power modes.

Figure 27:
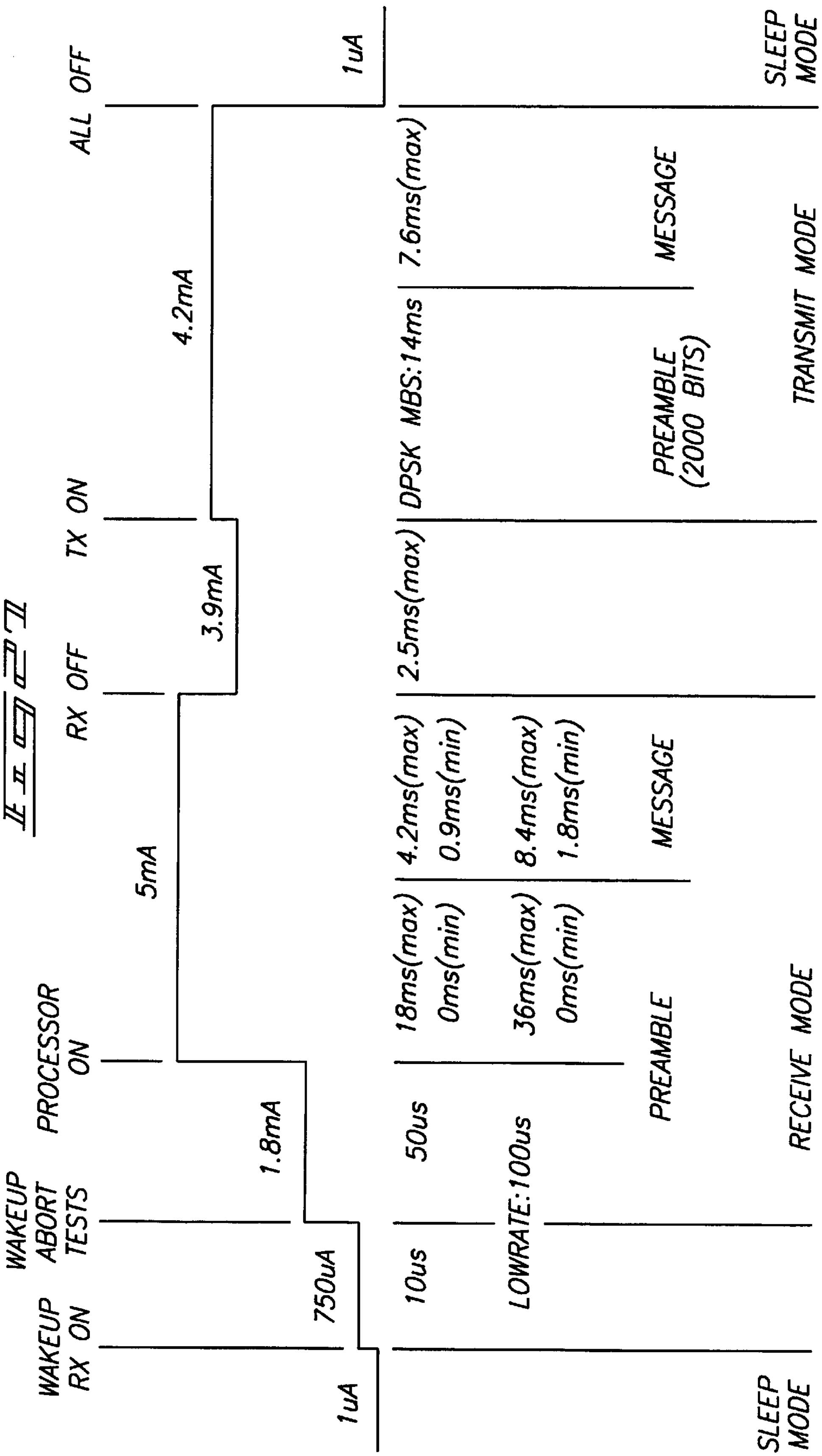

FIG. 27 is a diagram of current versus time illustrating switching between a low power sleep mode, and higher power modes.

Figure 28:
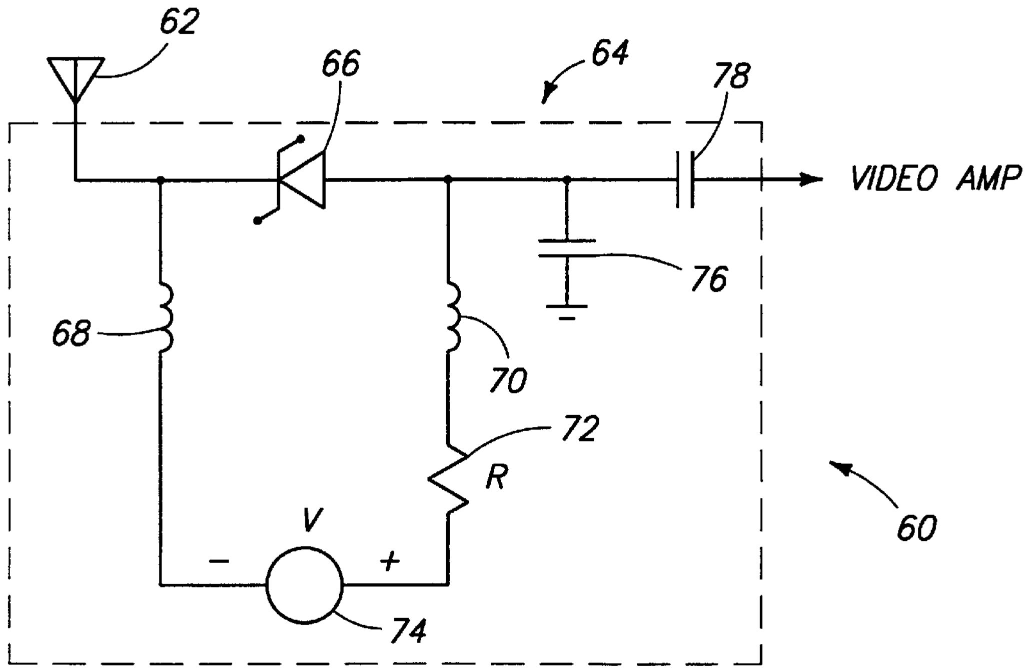

FIG. 28 is a circuit schematic illustrating a Schottky diode detector.

Figure 29:
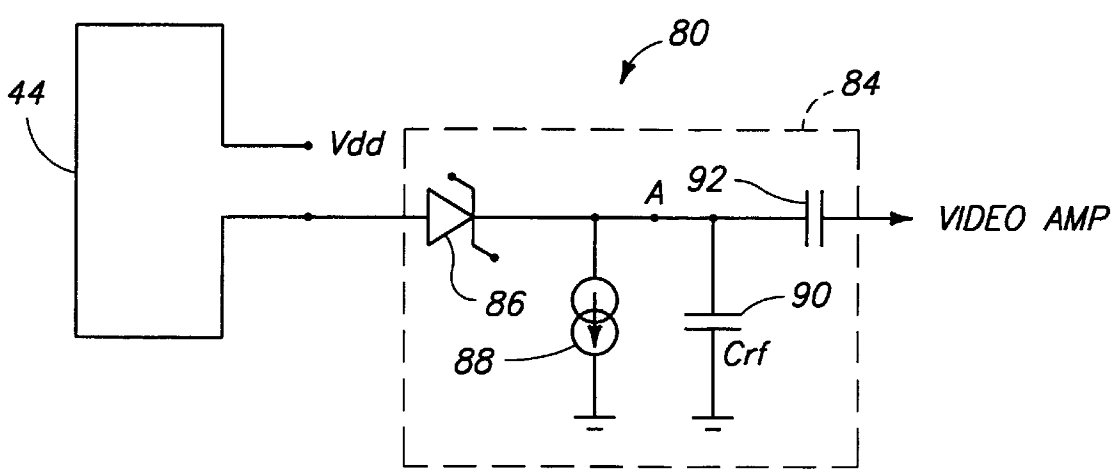

FIG. 29 is a circuit schematic illustrating a Schottky diode detector in accordance with one embodiment of the invention.

Figure 30:
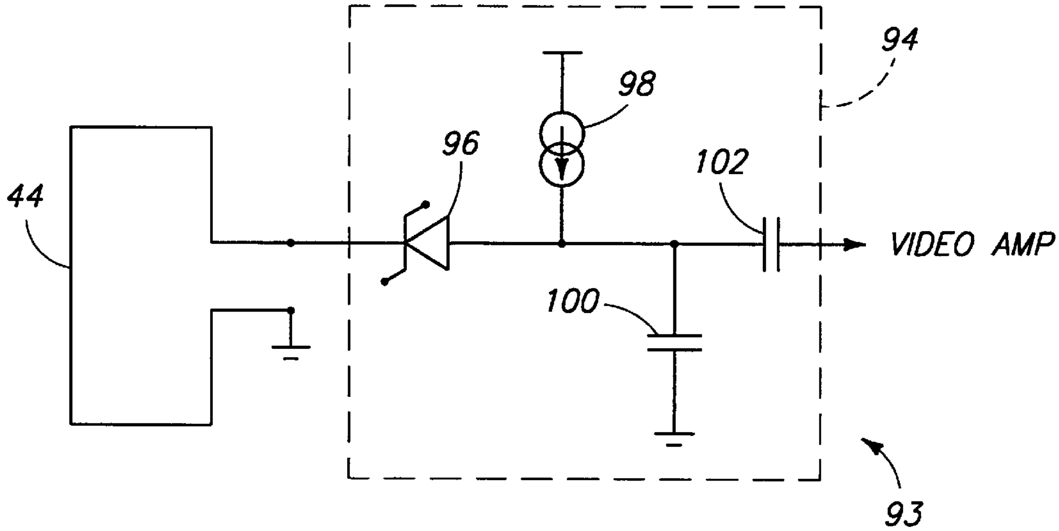

FIG. 30 is a circuit schematic illustrating a Schottky diode detector in accordance with another embodiment of the invention.

Figure 31:
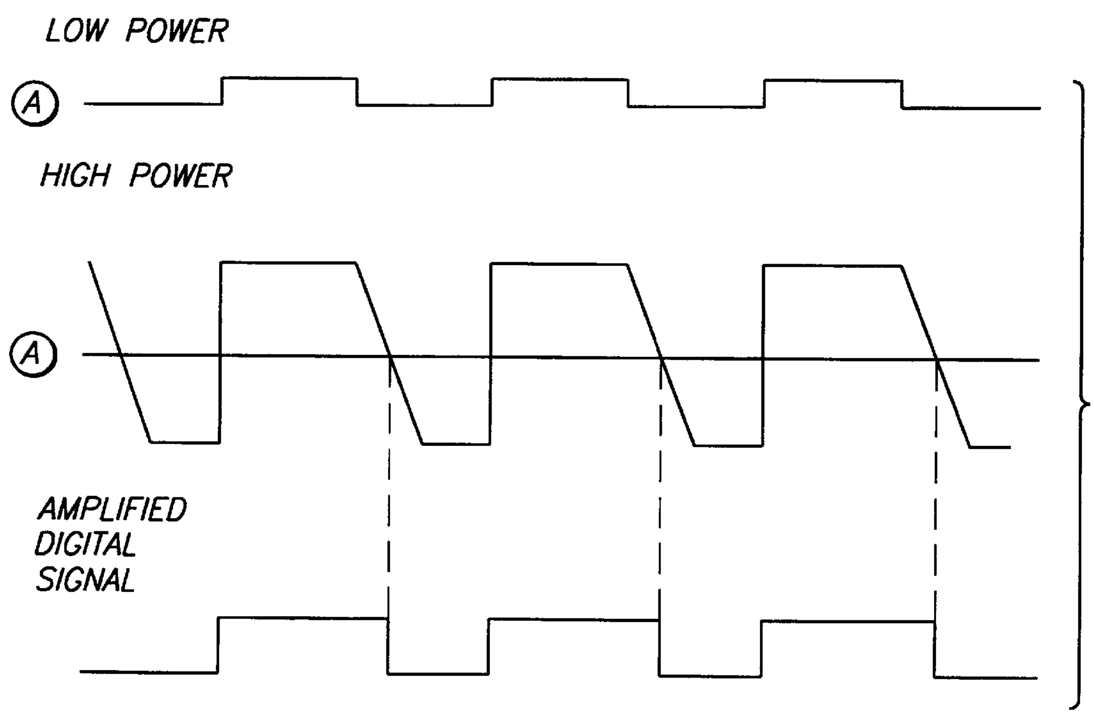

FIG. 31 is a waveform diagram illustrating the effect of high power radio frequency input levels on Schottky detectors.

Figure 32:
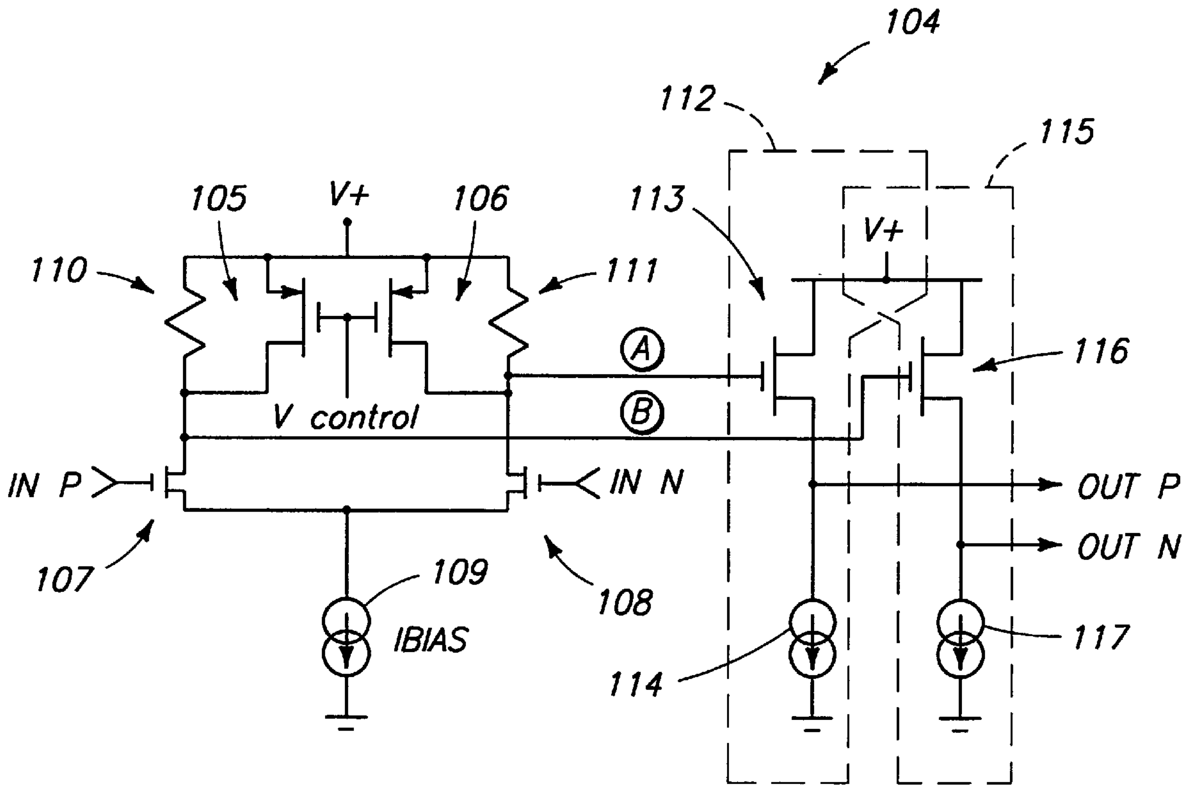

FIG. 32 is a circuit schematic illustrating a high frequency voltage controlled oscillator differential stage.

Figure 33:
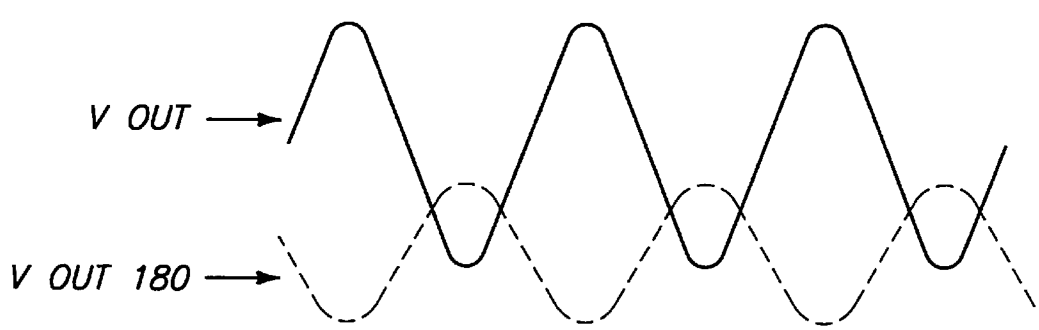

FIG. 33 is a waveform diagram illustrating the effect of errors in frequency doubler circuits that necessitates correction, such as by using an integrator and feedback.

Figure 34:
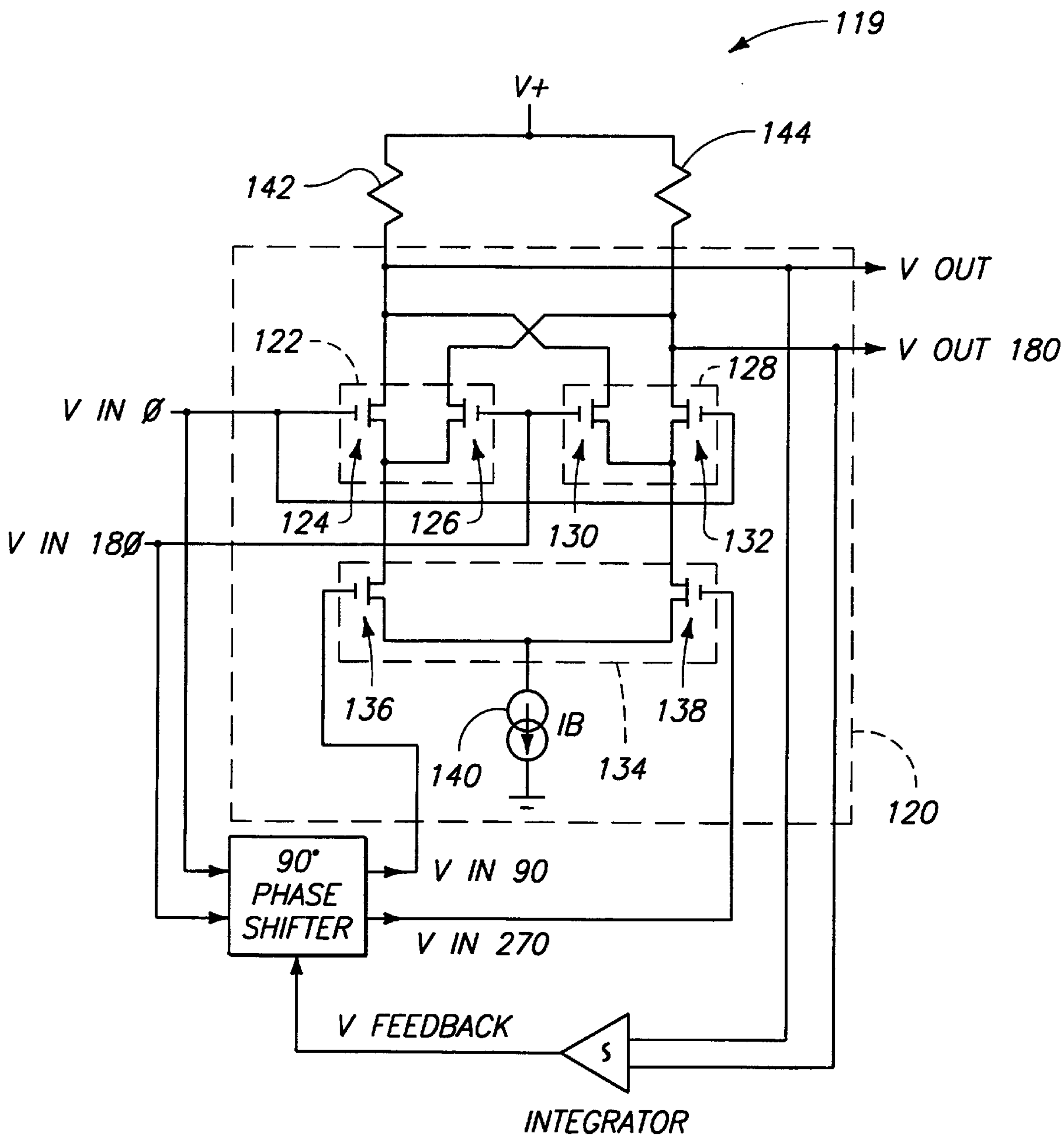

FIG. 34 is a circuit schematic illustrating a frequency doubler circuit that employs an integrator and feedback to solve the problem illustrated in FIG. 33.

Figure 35:
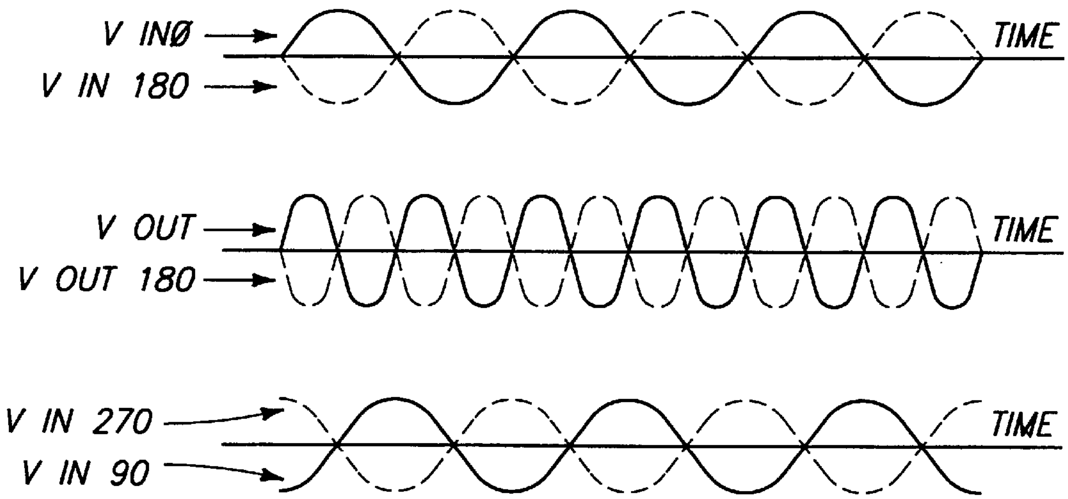

FIG. 35 is a waveform diagram illustrating input and output waves created and employed by a frequency doubler circuit such as the one shown in FIG. 34.

Figure 36:
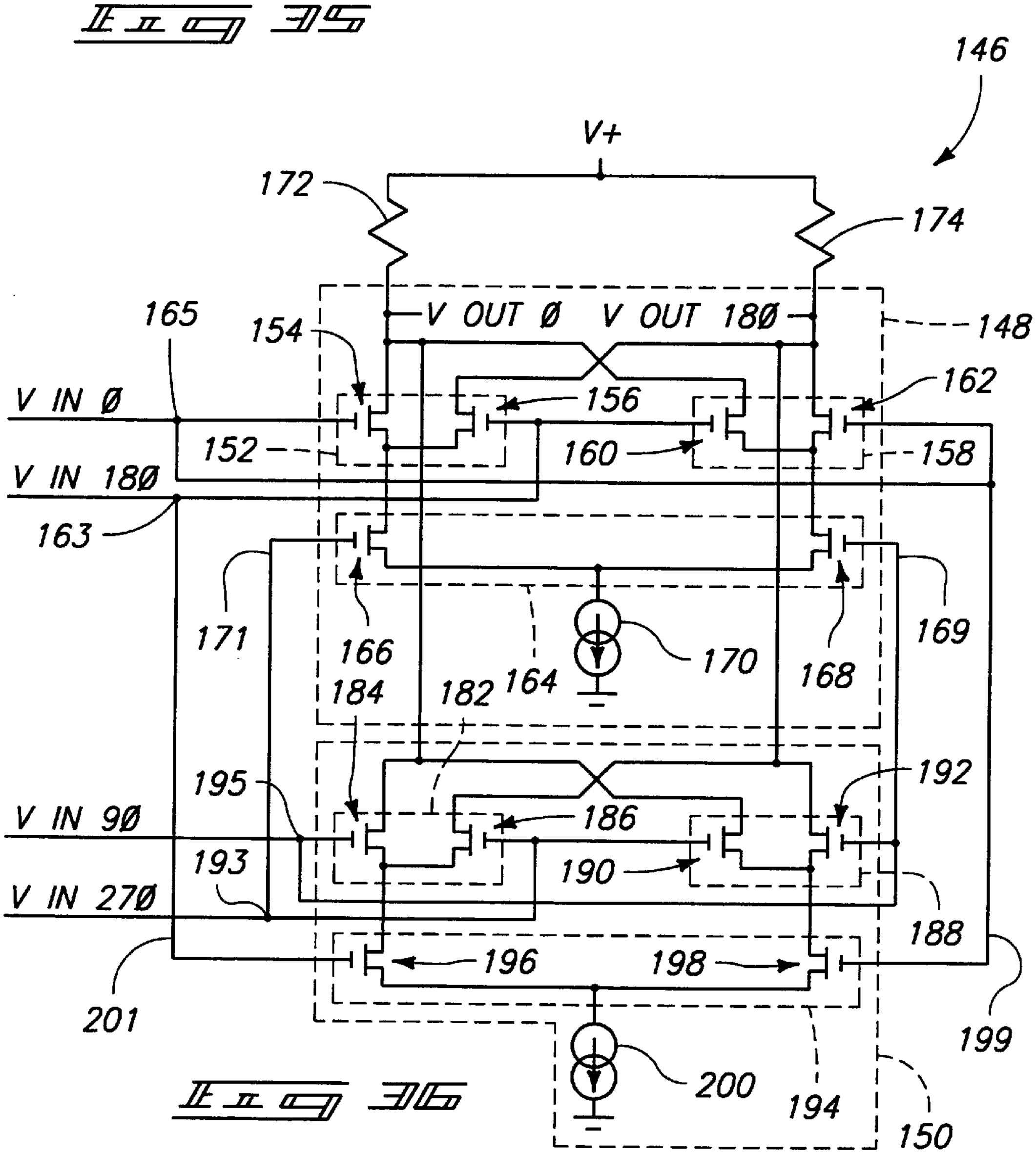

FIG. 36 is a circuit schematic illustrating a symmetric frequency doubler circuit that does not require an integrator and feedback to solve the problem illustrated in FIG. 33. The frequency doubler circuit of FIG. 36 creates and employs waveforms such as those shown in FIG. 35.

Figure 37:
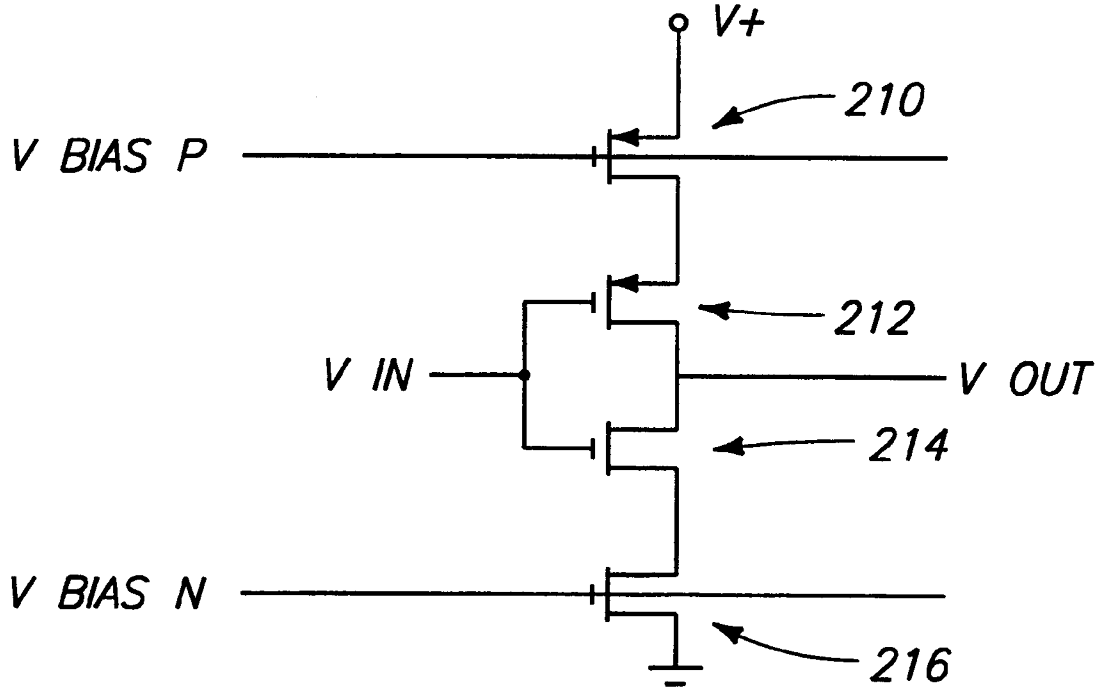
Figure 8E:
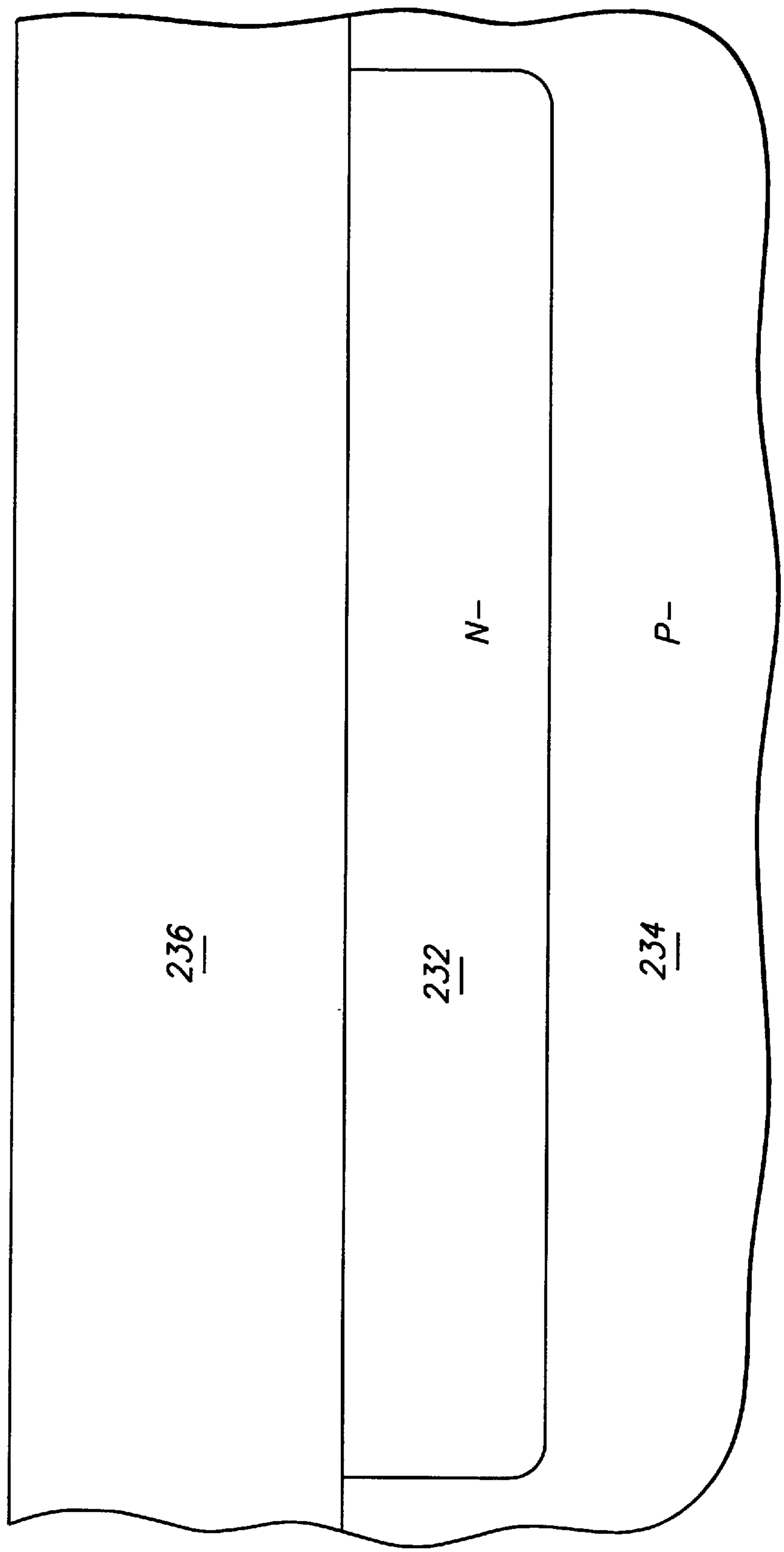

FIG. 37 is a circuit schematic of an inverter illustrating a power saving technique employed in a pseudo random number generator embodying one aspect of the invention.

FIG. 38 is a cross-sectional view illustrating a step of a process of manufacturing a Schottky diode.

Figure 39:
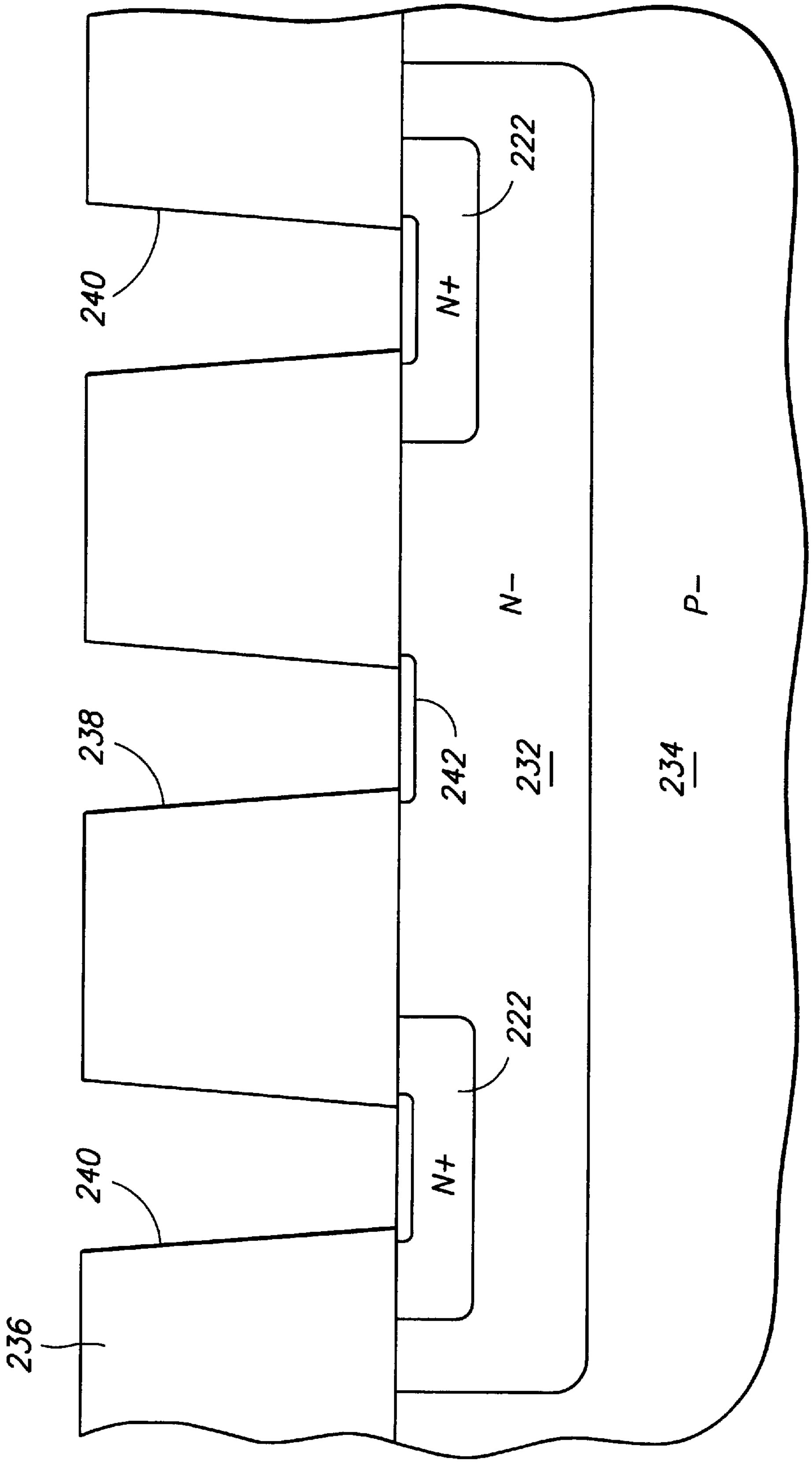

FIG. 39 is a cross-sectional view illustrating a step subsequent to the step of FIG. 38.

Figure 40:
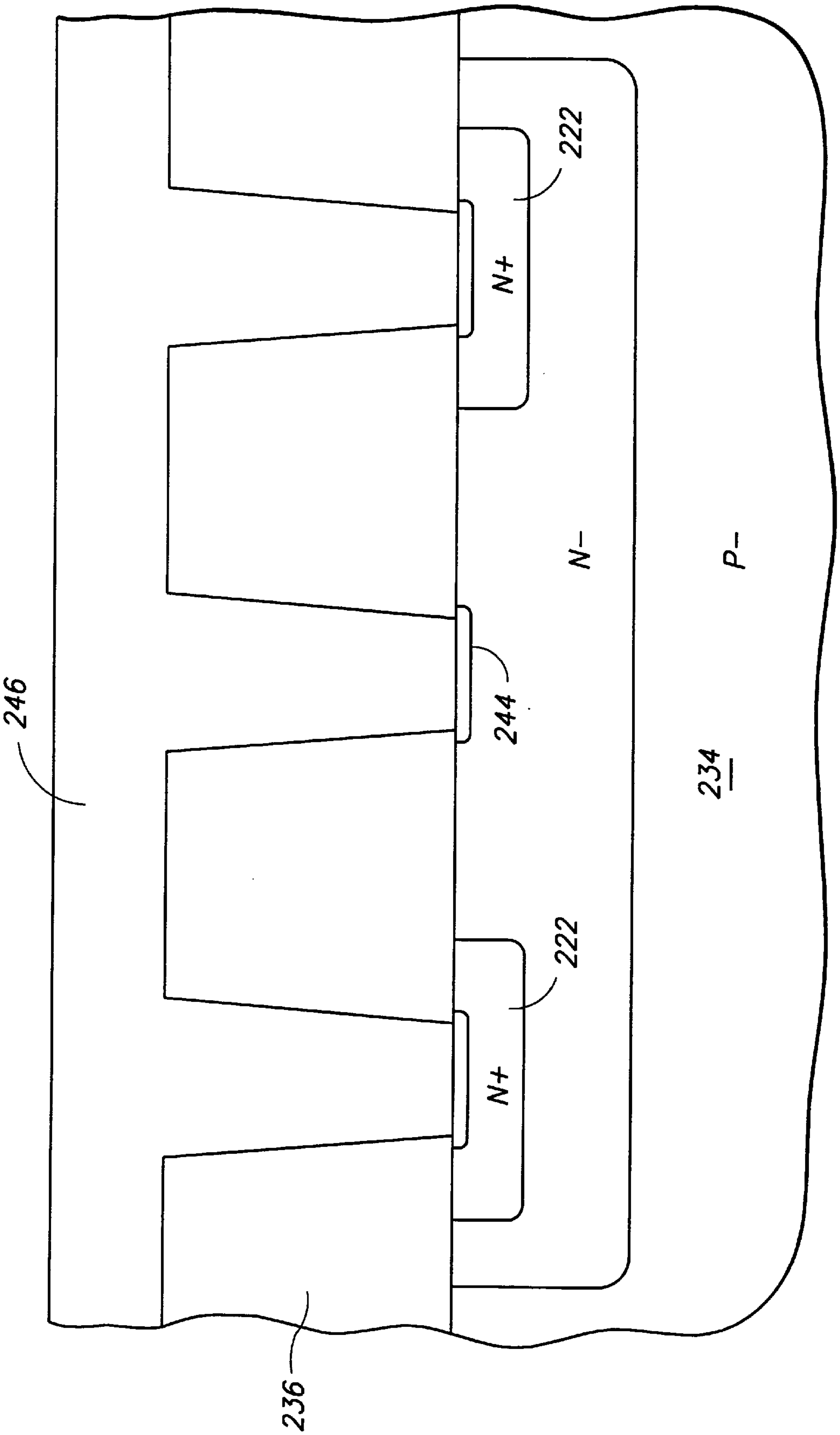

FIG. 40 is a cross-sectional view illustrating a step subsequent to the step of FIG. 39.

Figure 41:
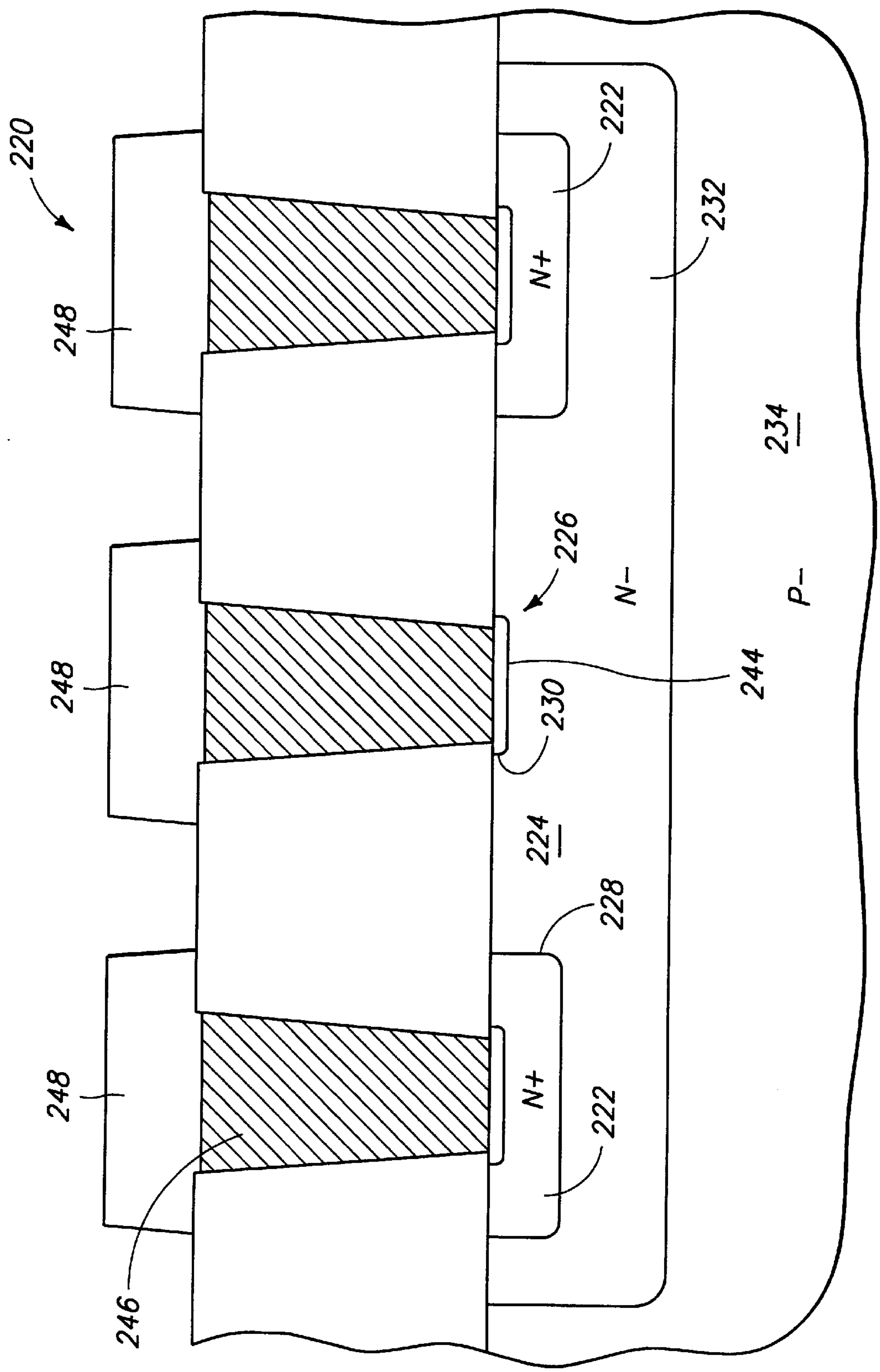

FIG. 41 is a cross-sectional view illustrating a step subsequent to the step of FIG. 40.

Figure 42:
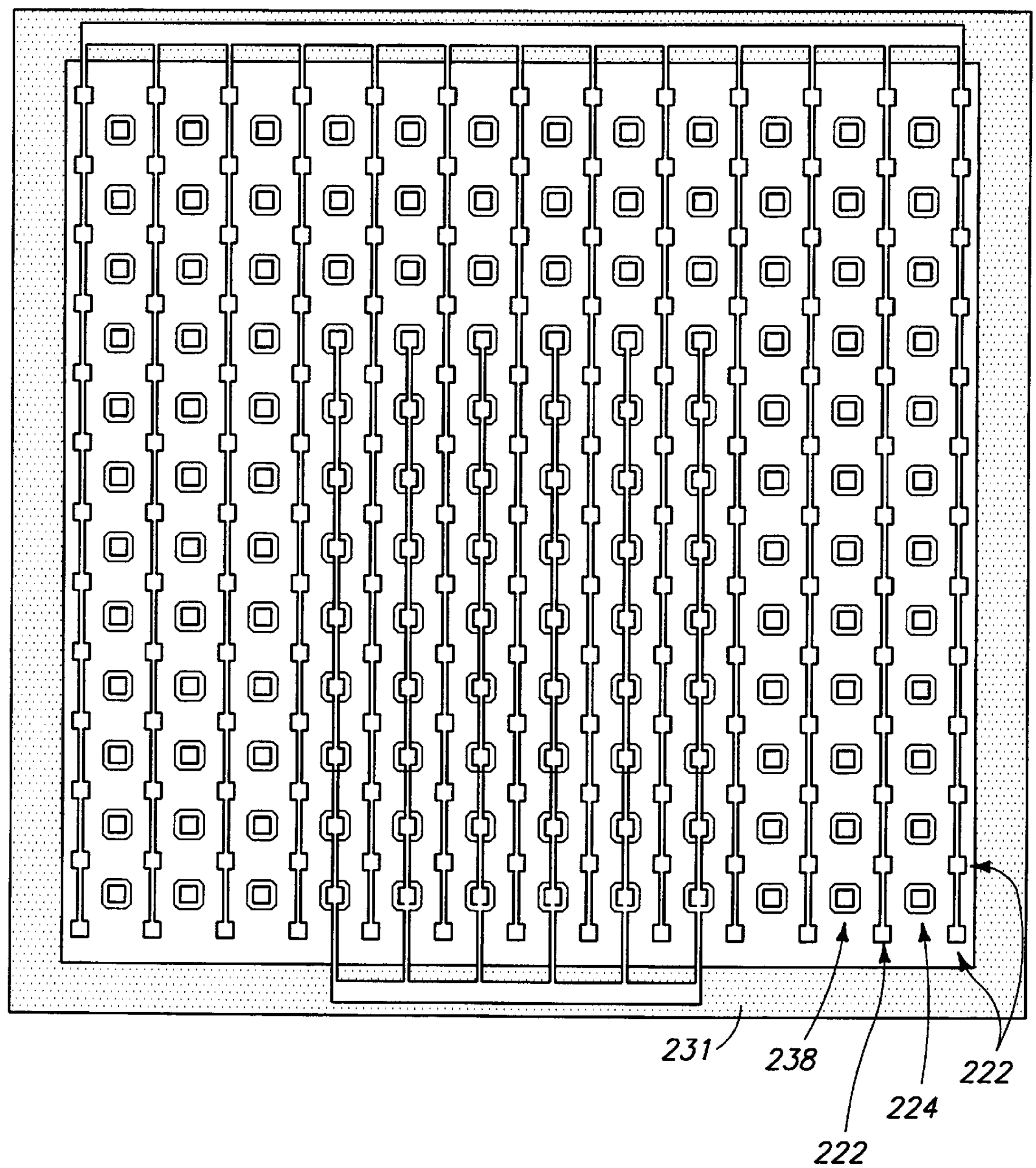

FIG. 42 is a top view illustrating a step subsequent to the step of FIG. 41 and showing parallel connection of some Schottky diodes of a plurality of Schottky diodes.

Figure 43:
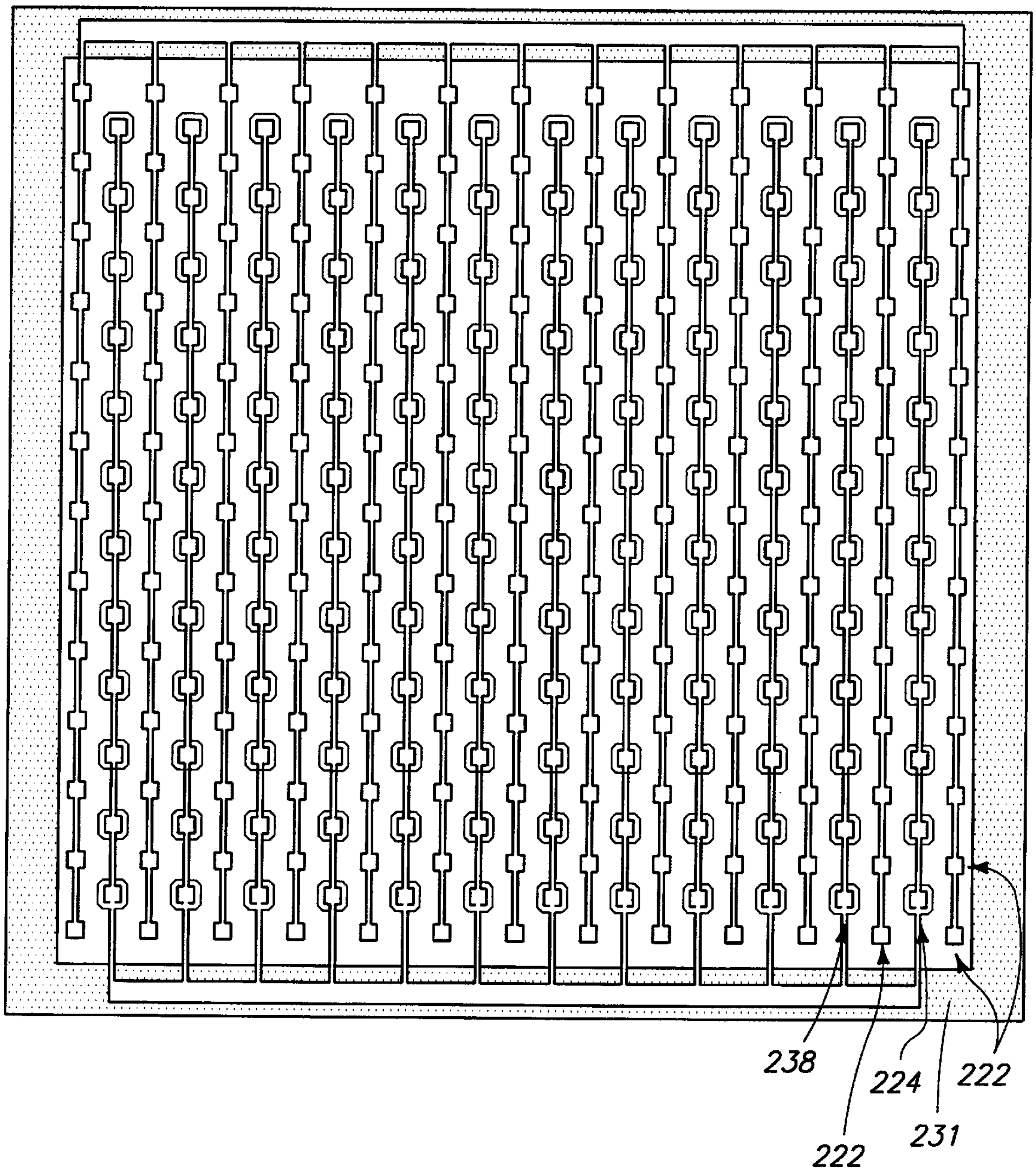

FIG. 43 is a top view illustrating a step subsequent to the step of FIG. 41 in accordance with an alternative embodiment of the invention and showing parallel connection of all Schottky diodes of a plurality of Schottky diodes.

FIG. 44 is a cross-sectional view illustrating a step of an alternative process of manufacturing a Schottky diode.

FIG. 45 is a cross-sectional view illustrating a step subsequent to the step of FIG. 44.

Figure 46:
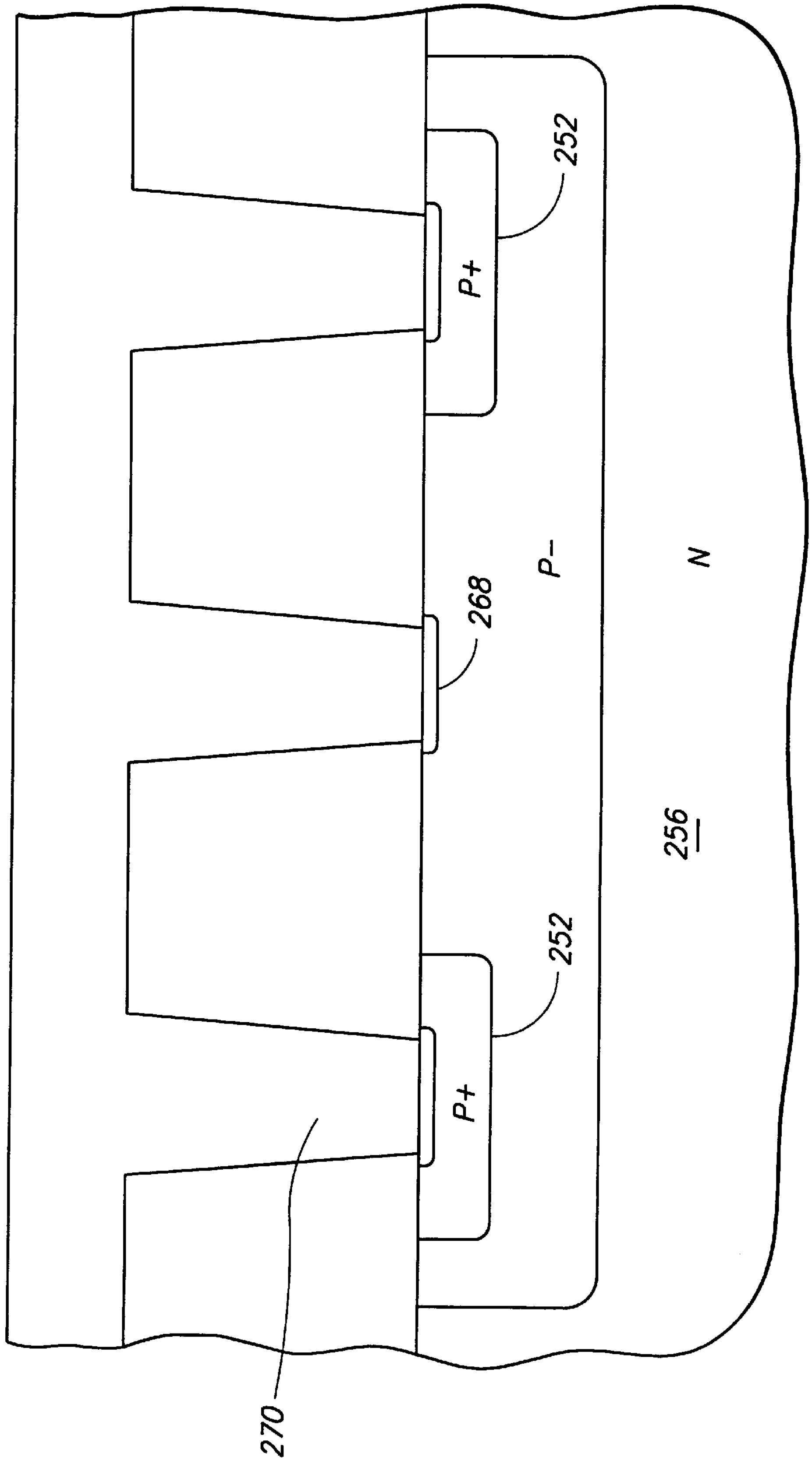

FIG. 46 is a cross-sectional view illustrating a step subsequent to the step of FIG. 45.

Figure 47:
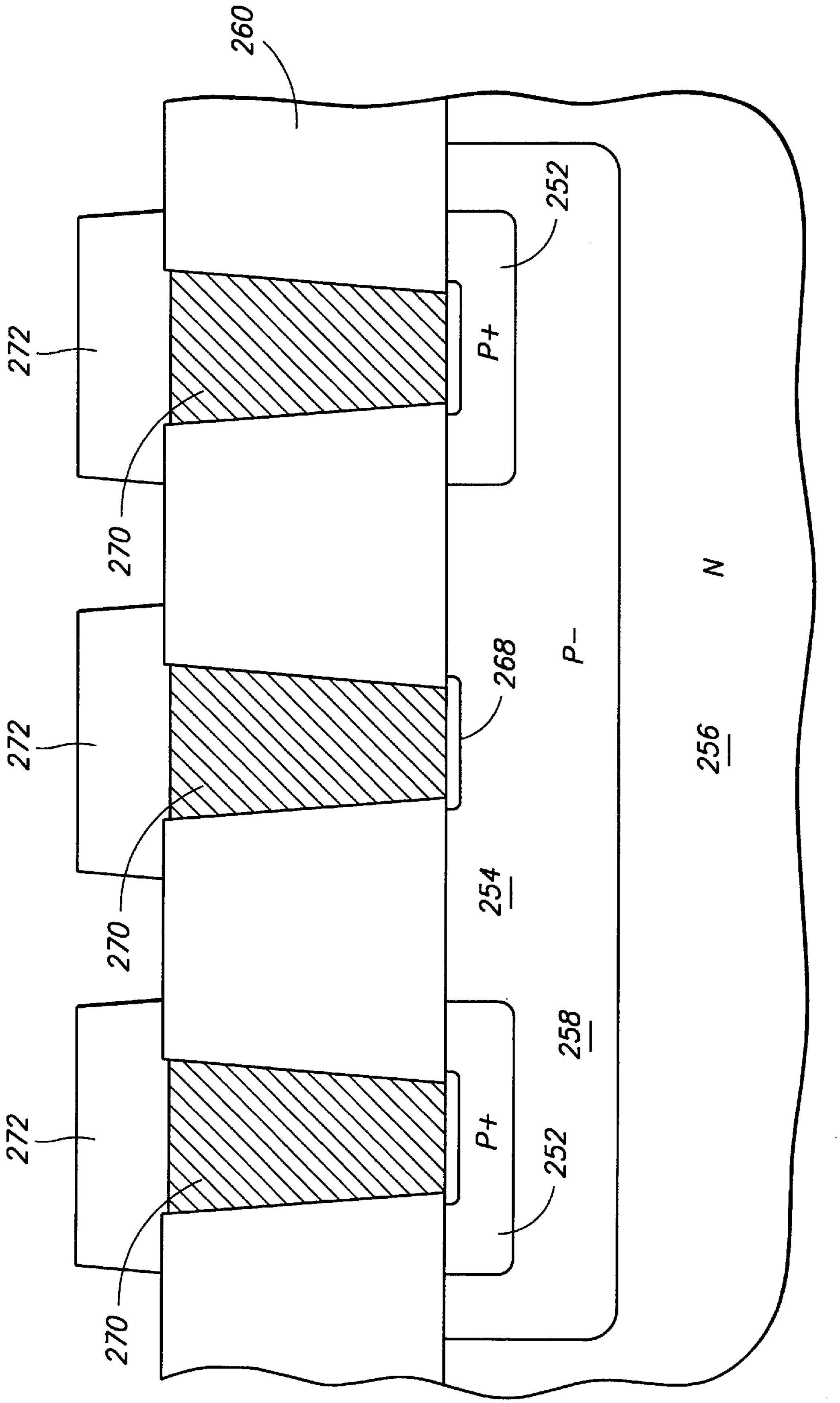

FIG. 47 is a cross-sectional view illustrating a step subsequent to the step of FIG. 46.

Figure 48:
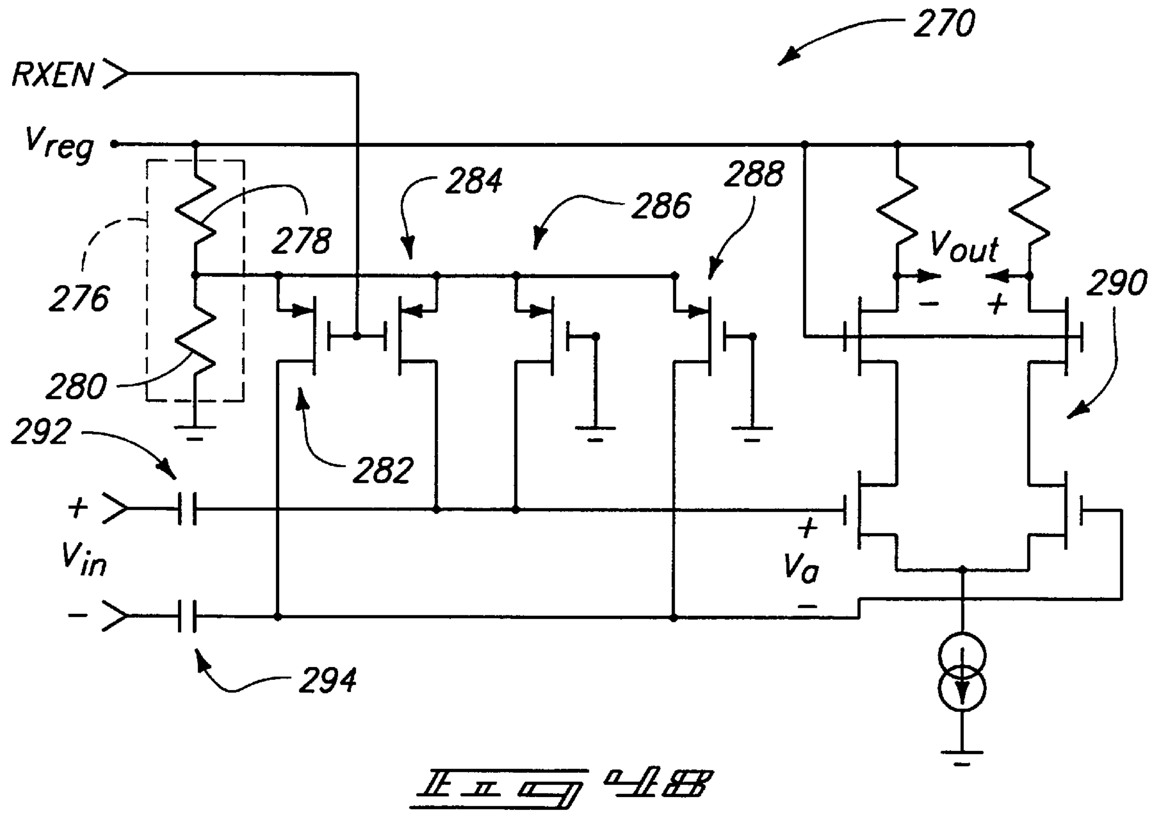

FIG. 48 is a simplified circuit schematic of a quick bias AC-coupled video amplifier included in the integrated circuit.

Figure 49:
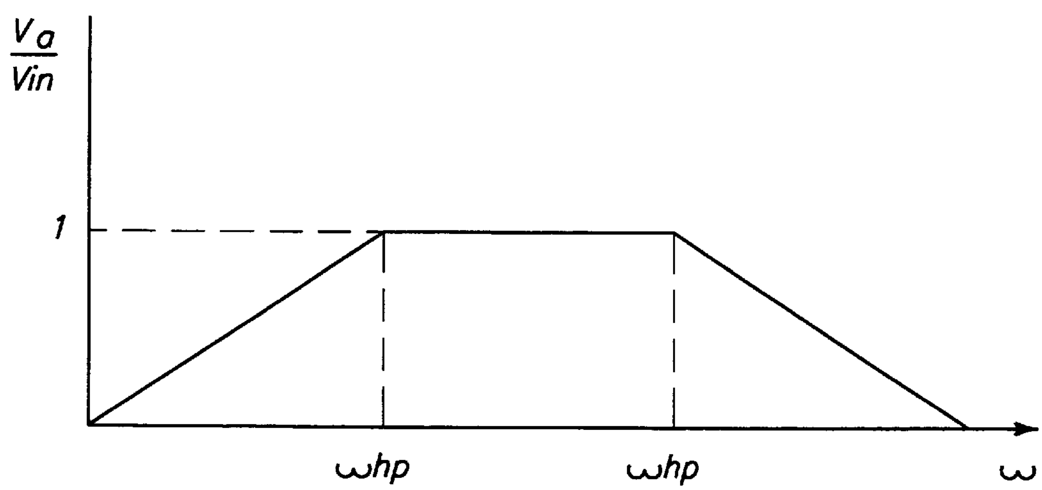

FIG. 49 is a plot of voltage versus angular frequency illustrating selection of components to realize a desired high pass roll off frequency in the amplifier of FIG. 48.

Figure 50:
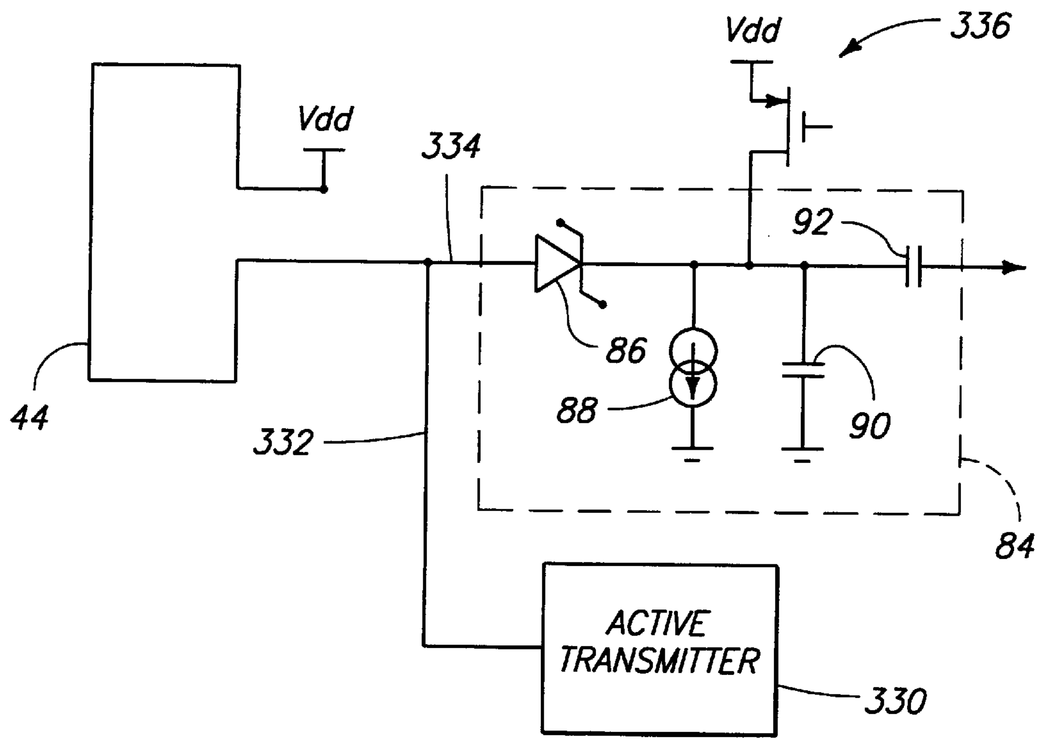

FIG. 50 is a simplified circuit schematic illustrating sharing of a single antenna by both a Schottky detector and an active transmitter.

Figure 51:
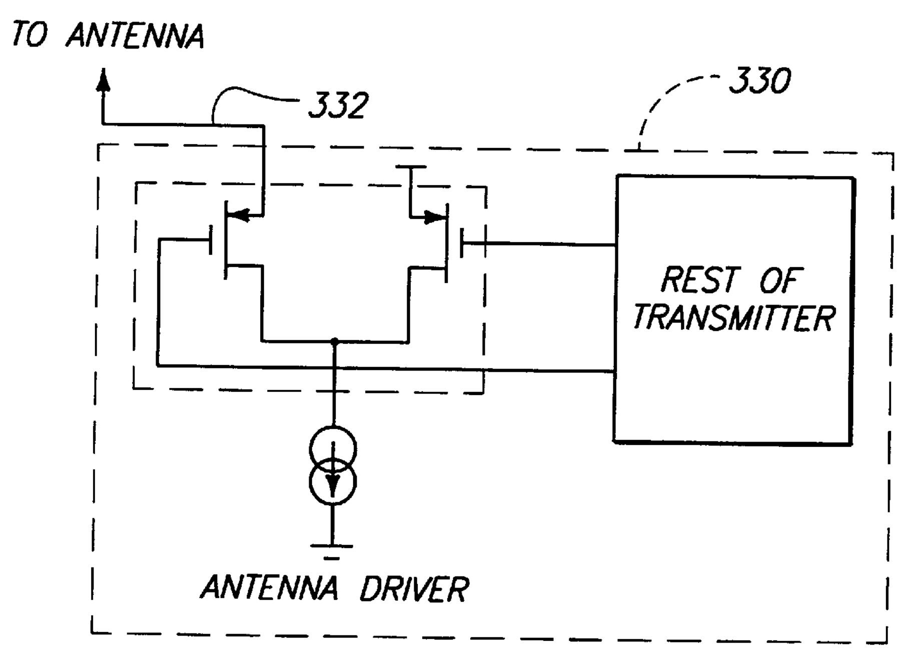

FIG. 51 is a simplified circuit schematic illustrating circuitry included in the active transmitter of FIG. 50 in accordance with one aspect of the invention.

Figure 52:
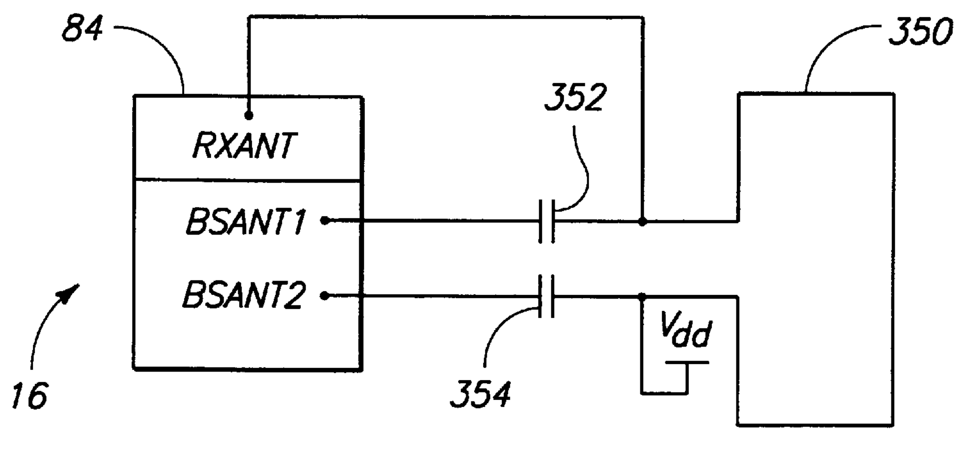

FIG. 52 is a simplified circuit schematic illustrating sharing of a single antenna by both a Schottky detector and a backscatter transmitter.

Figure 53:
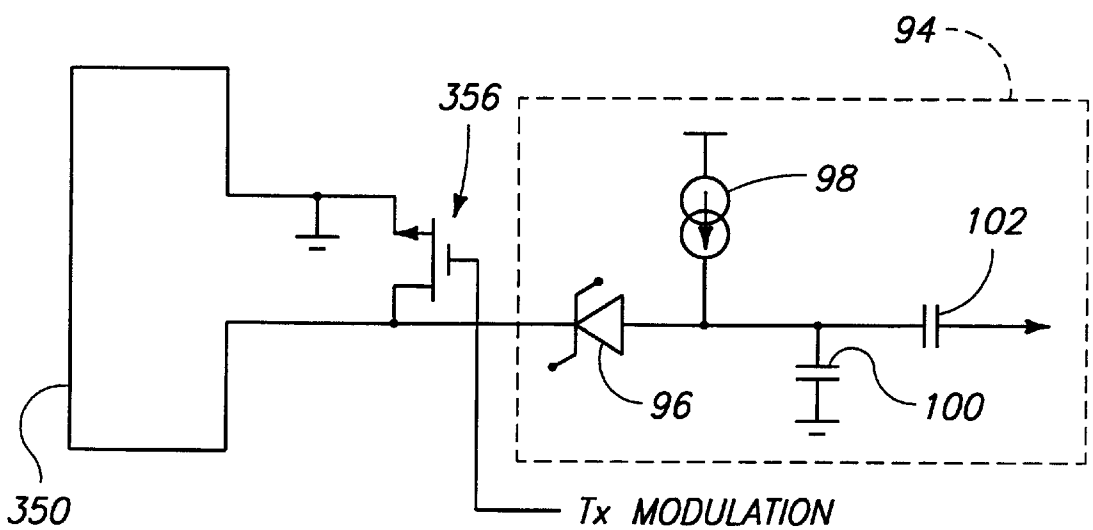
Figure 54:
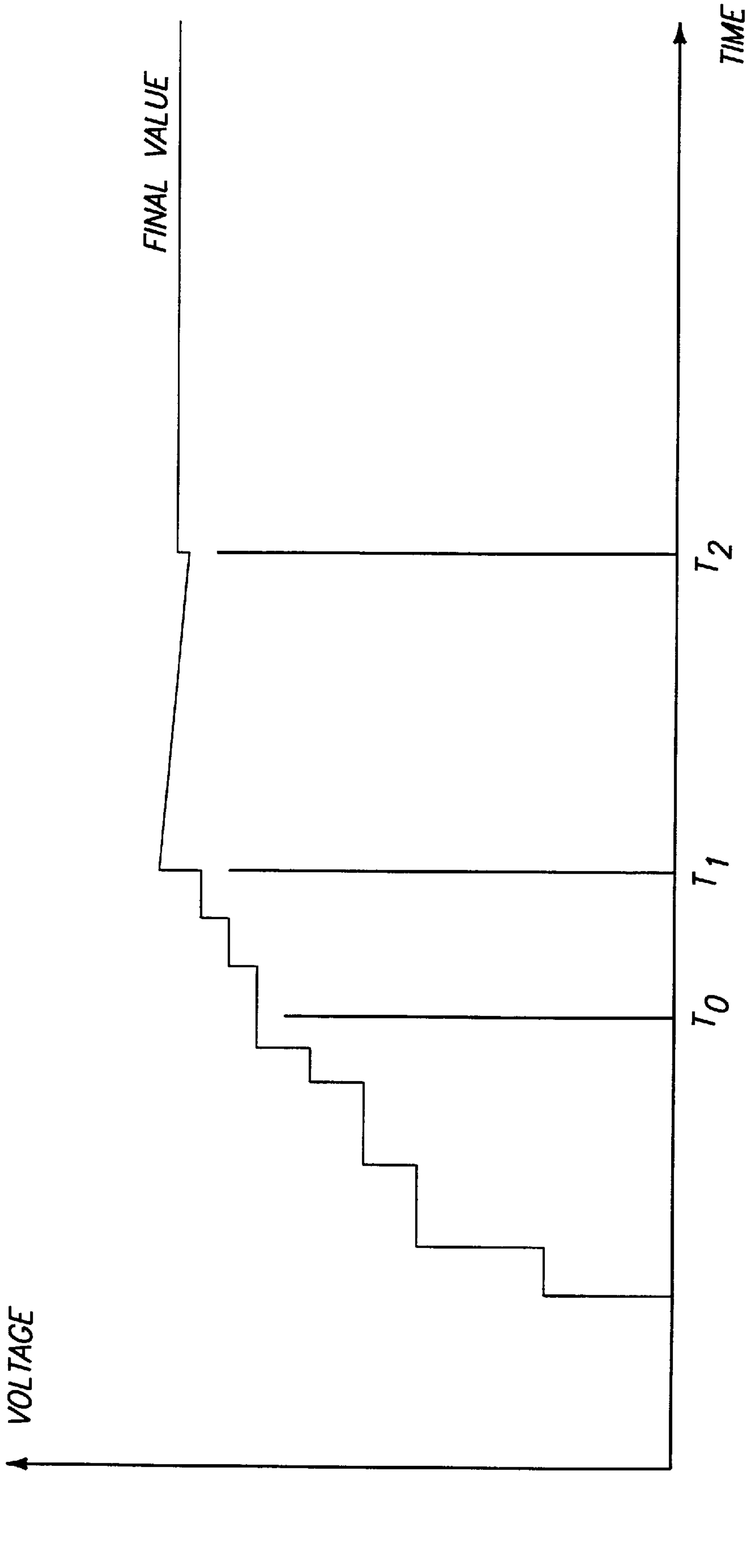

FIG. 53 is a simplified circuit schematic illustrating sharing of a single antenna by both a Schottky detector and a backscatter transmitter in accordance with an alternative embodiment of the invention.

Figure 54:
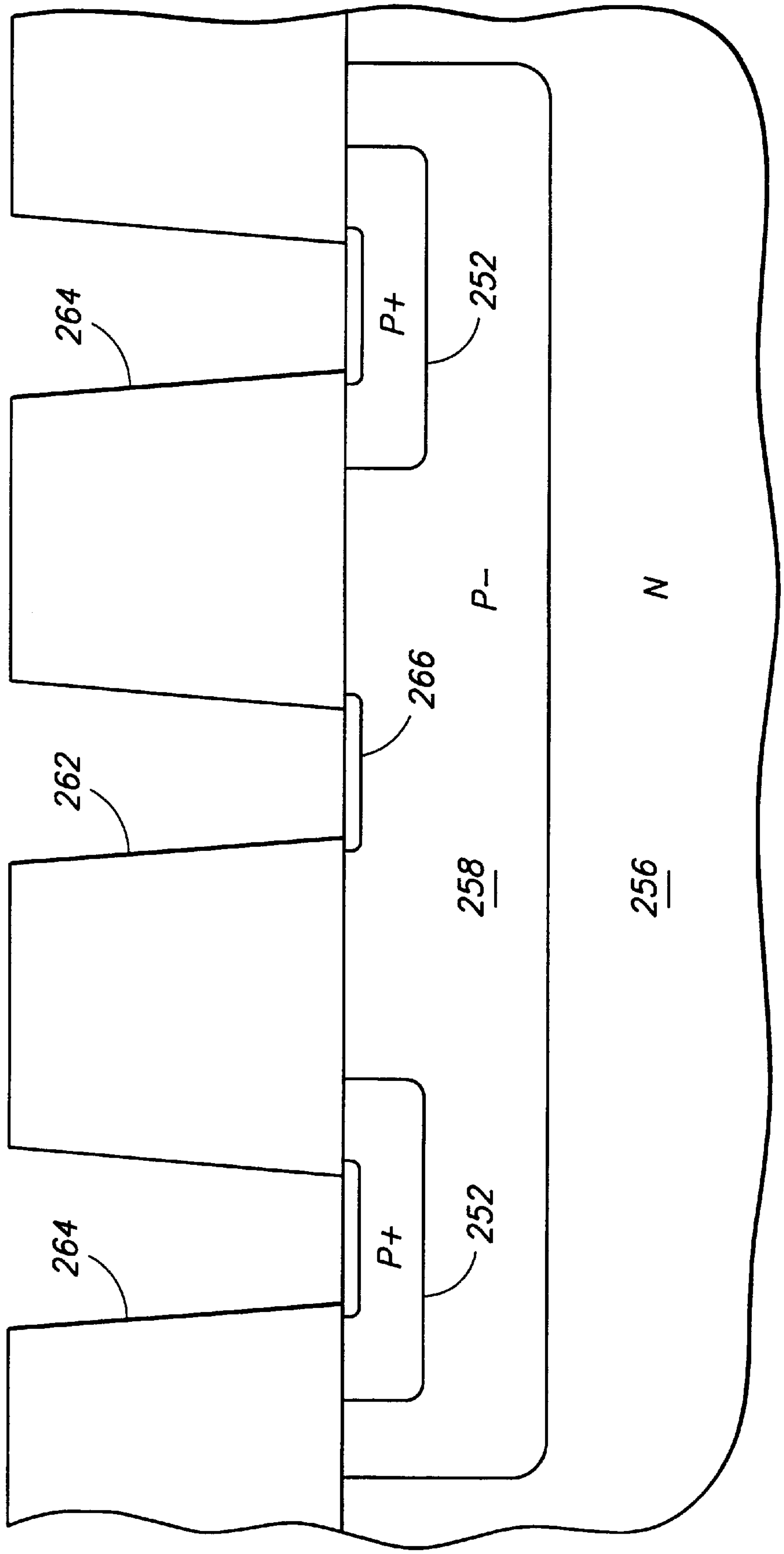

FIG. 54 is a graph of voltage versus time illustrating a method of determining when frequency lock has occurred.

Figure 55:
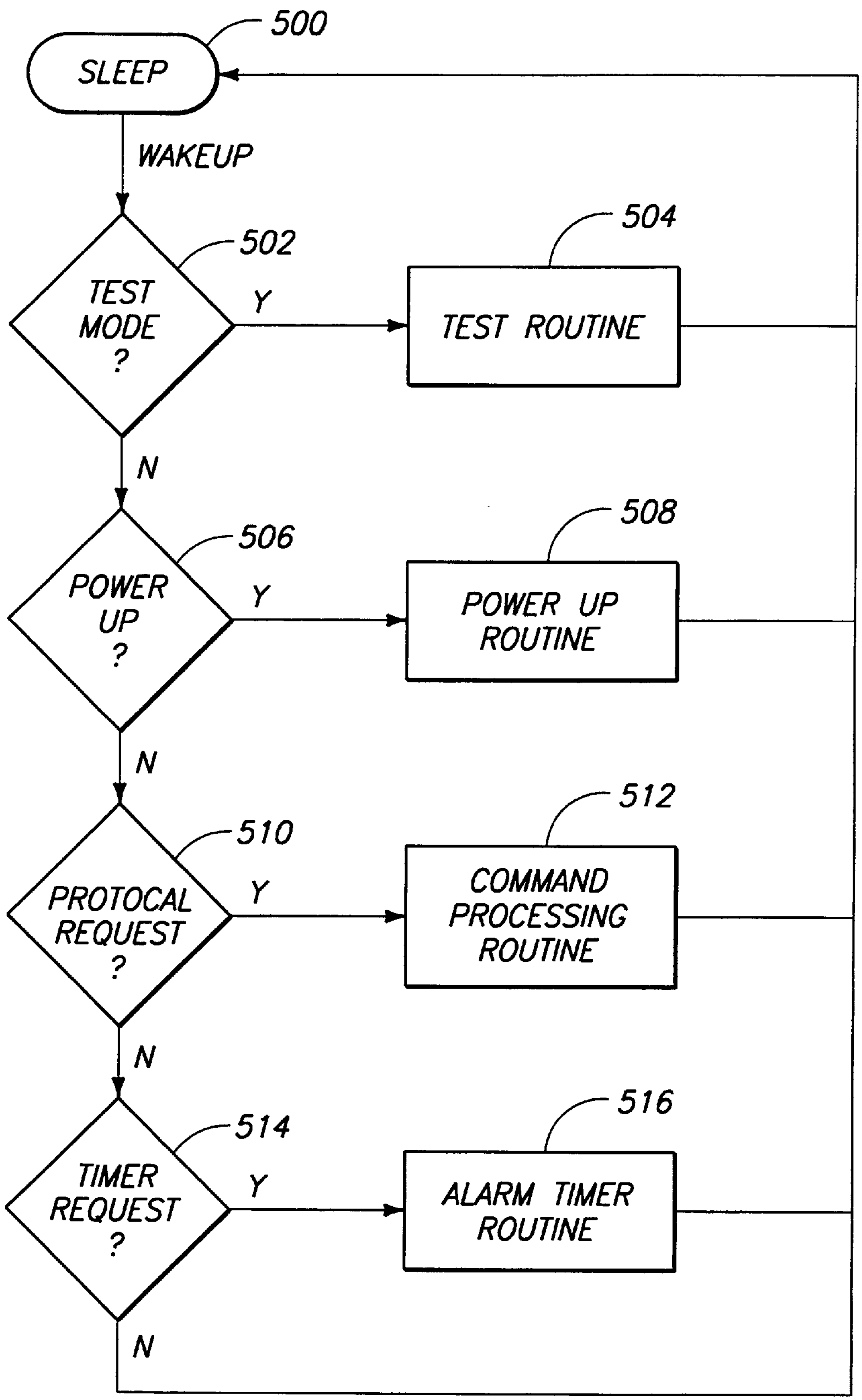

FIG. 55 is a flowchart illustrating a top level of code stored in ROM in the integrated circuit.

Figure 56A:
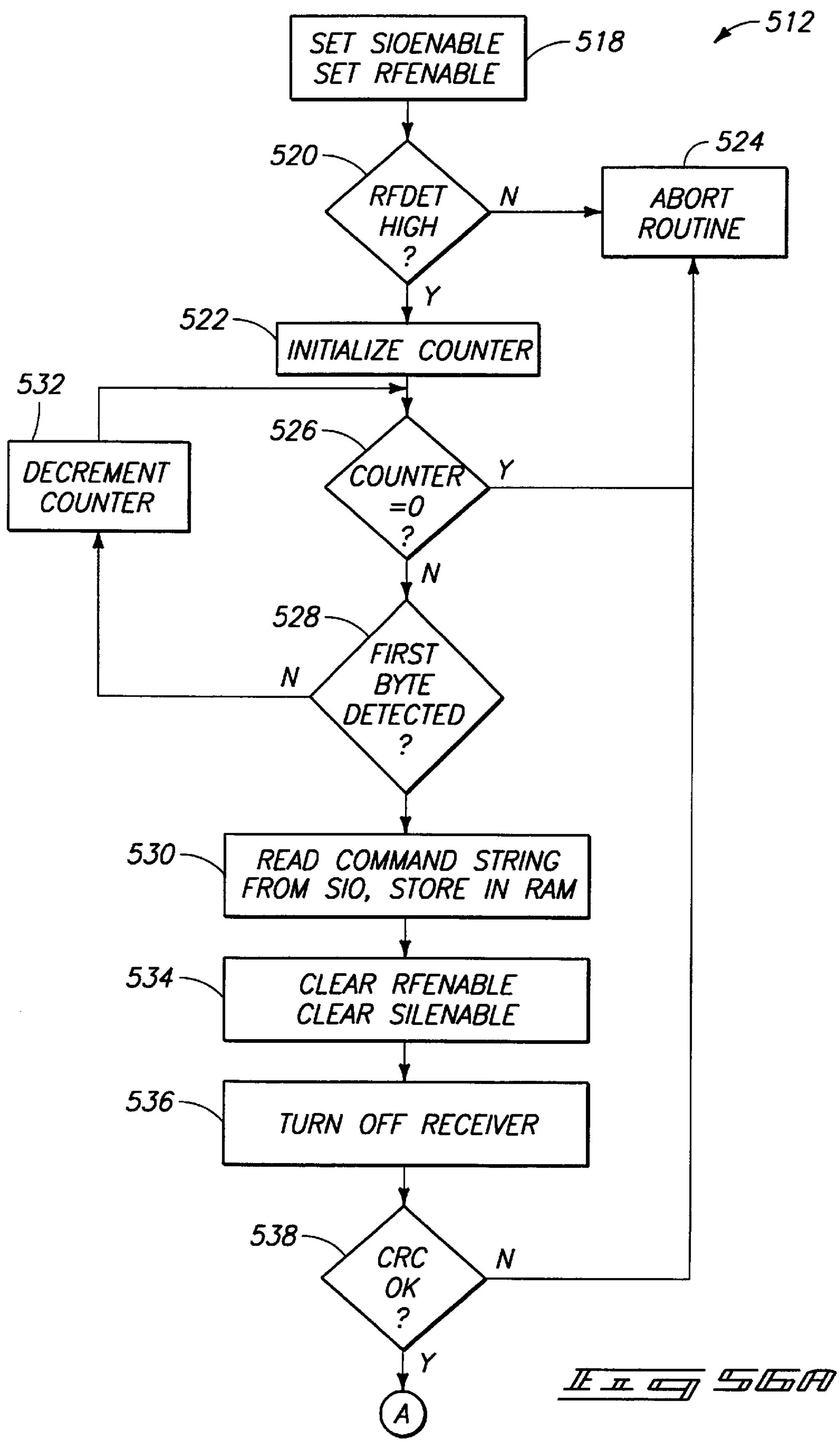

FIGS. 56A and B define a flowchart illustrating a command processing routine performed by the integrated circuit.

FIGS. 57A and B define a flowchart illustrating steps performed by the integrated circuit in response to an Identify command received from the interrogator in which the interrogator requests, via radio frequency command, identification of an integrated circuit.

Figure 58:
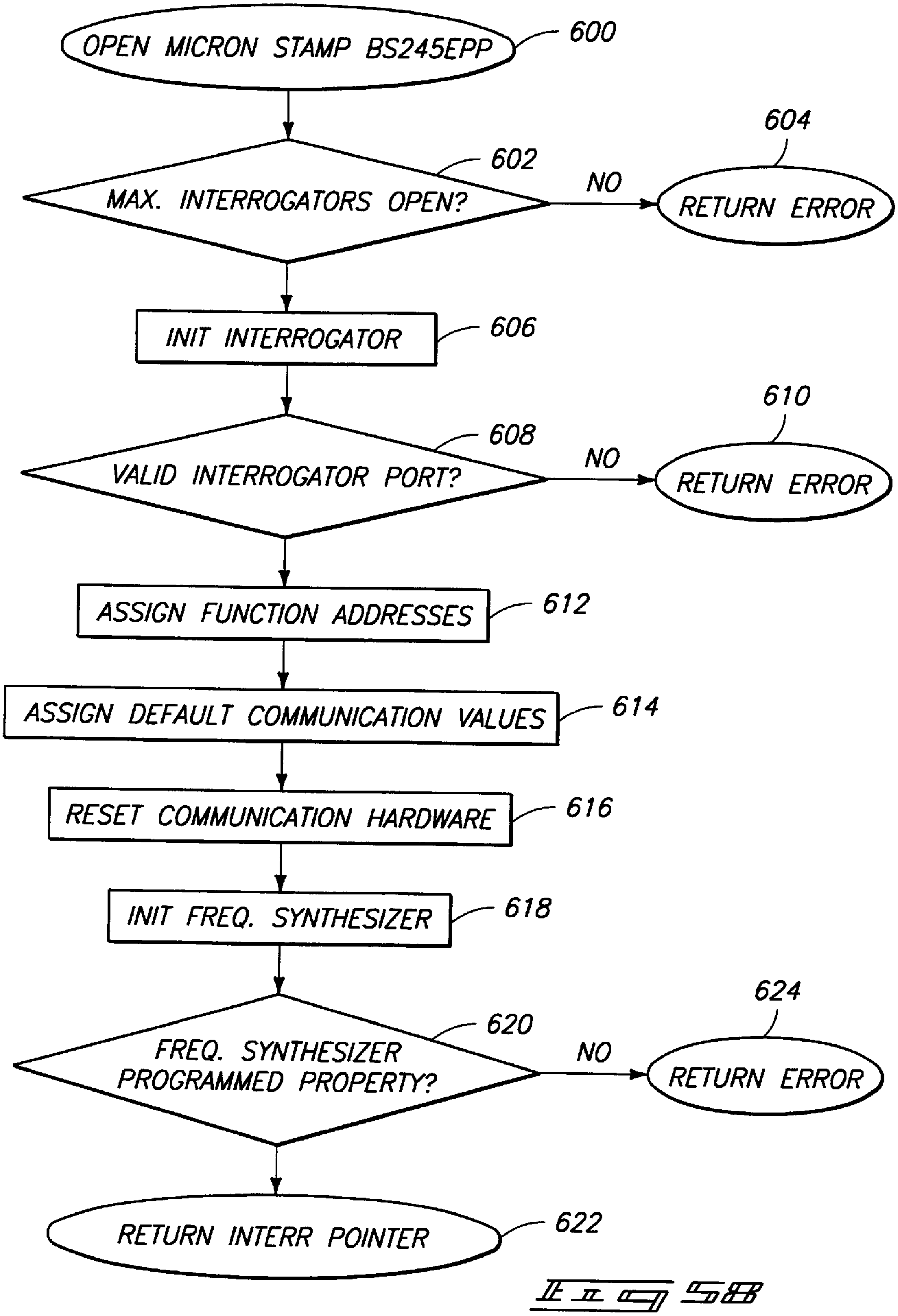

FIG. 58 is a flowchart illustrating steps performed to initialize the interrogator.

Figure 59:
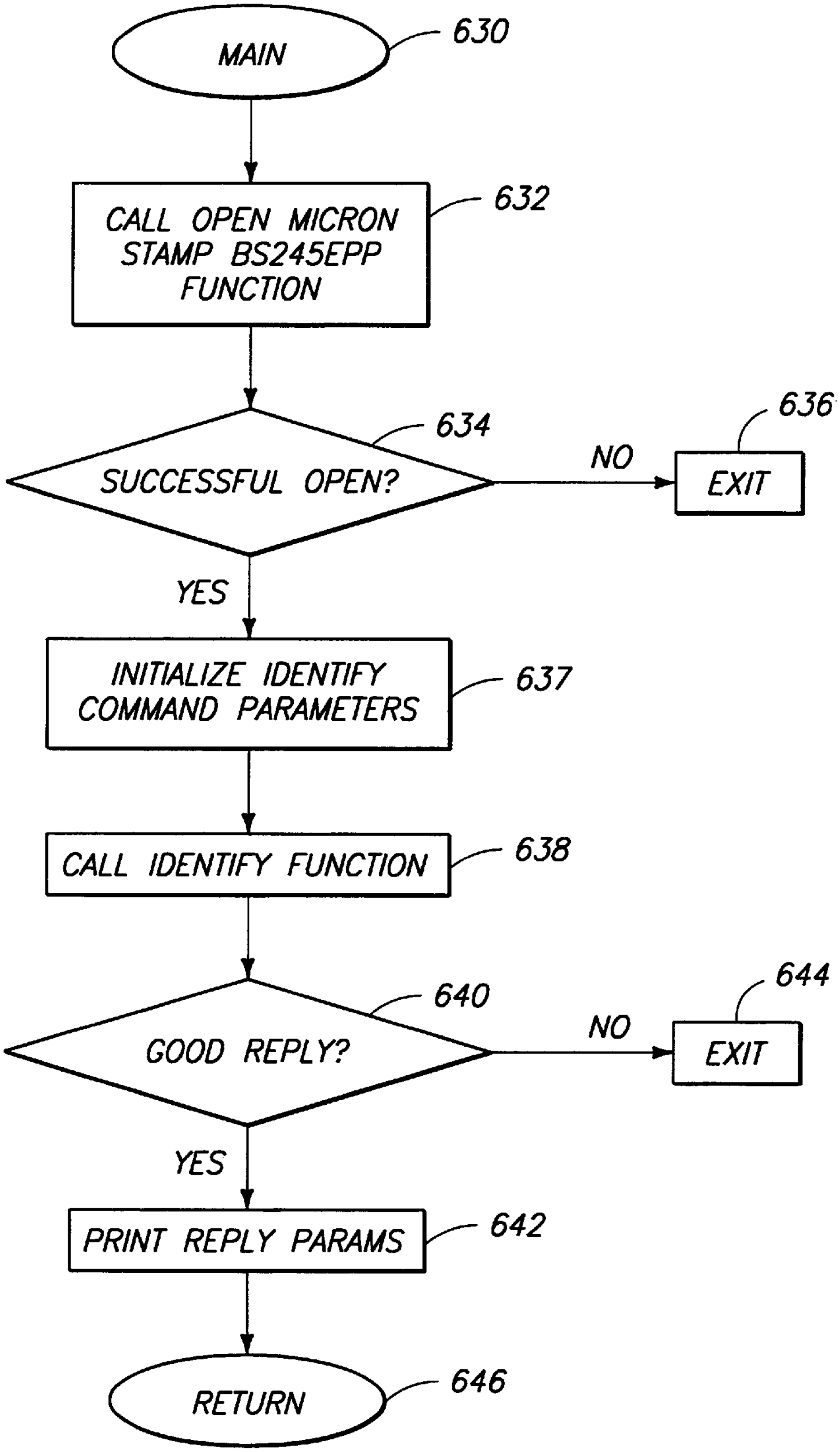

FIG. 59 is a flowchart illustrating steps performed when the interrogator sends a command to the integrated circuit.

Figure 60:
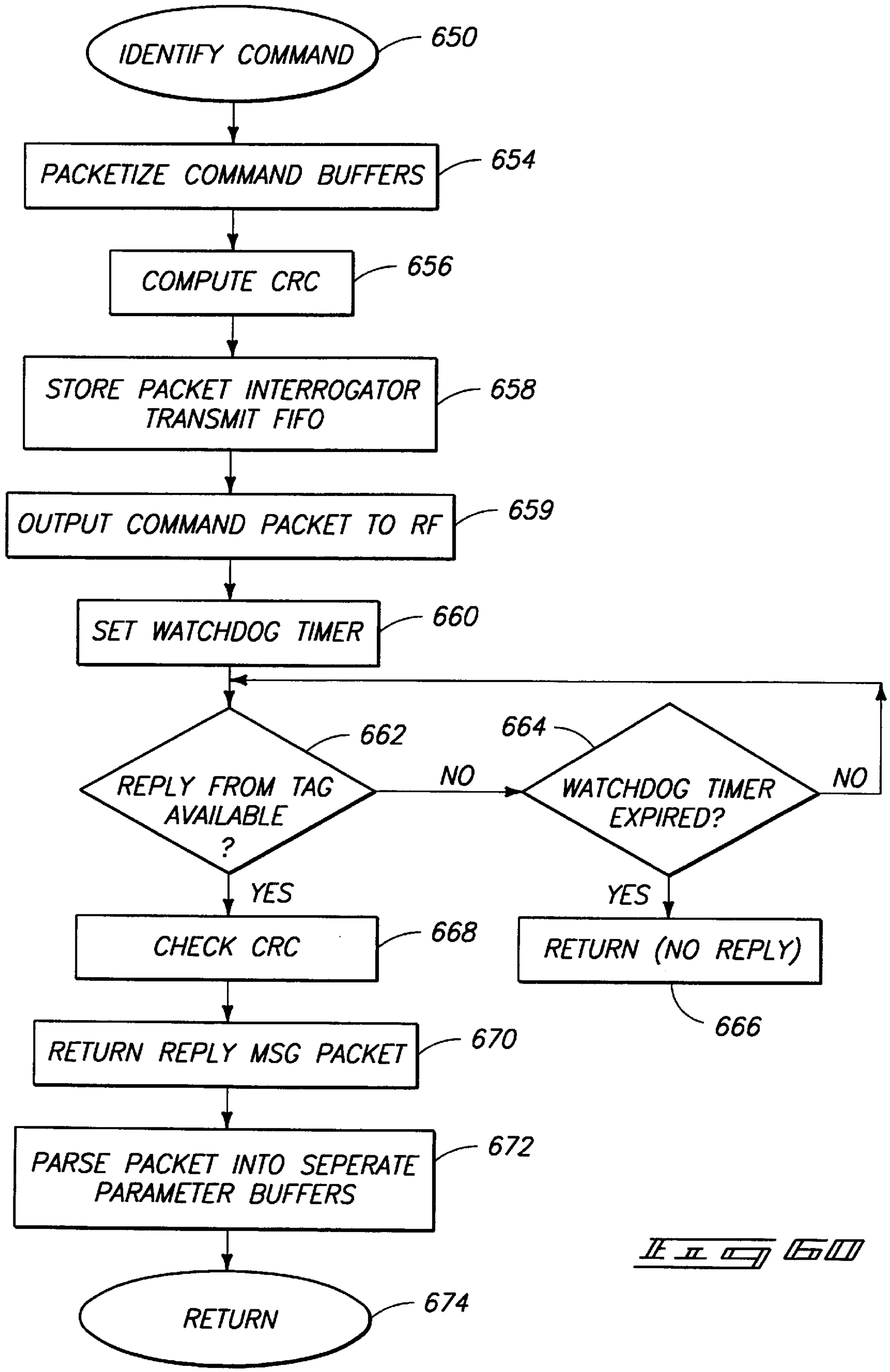
Figure 11:
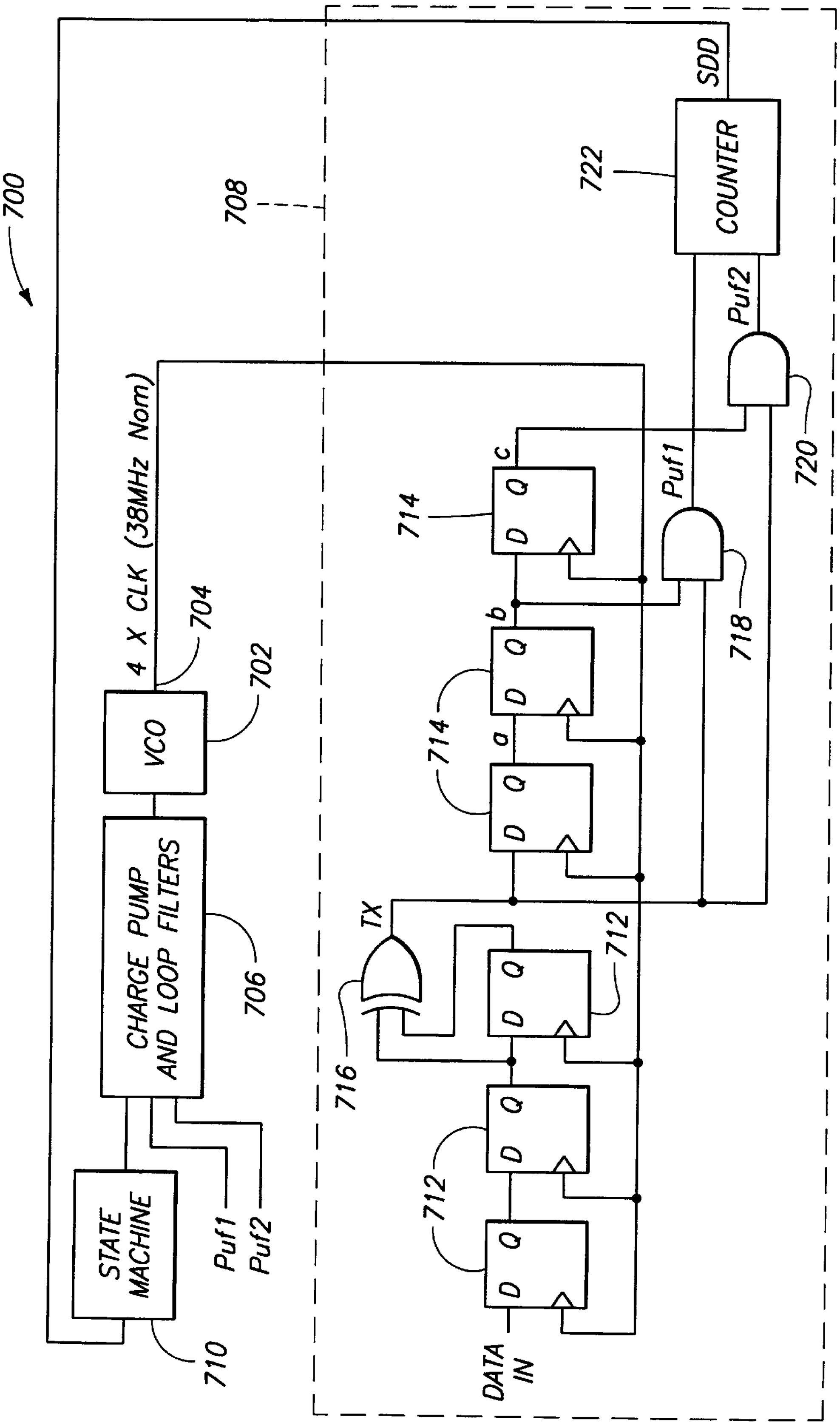

FIG. 60 is a flowchart illustrating steps performed by the interrogator in issuing an Identify command.

FIG. 61 is a simplified circuit diagram of a digital clock recovery loop including a start-up circuit including a counter, a voltage controlled oscillator, a charge pump and loop filter, and a state machine. The start-up circuit and counter determine when clock frequency is close to a desired value.

Figure 62:
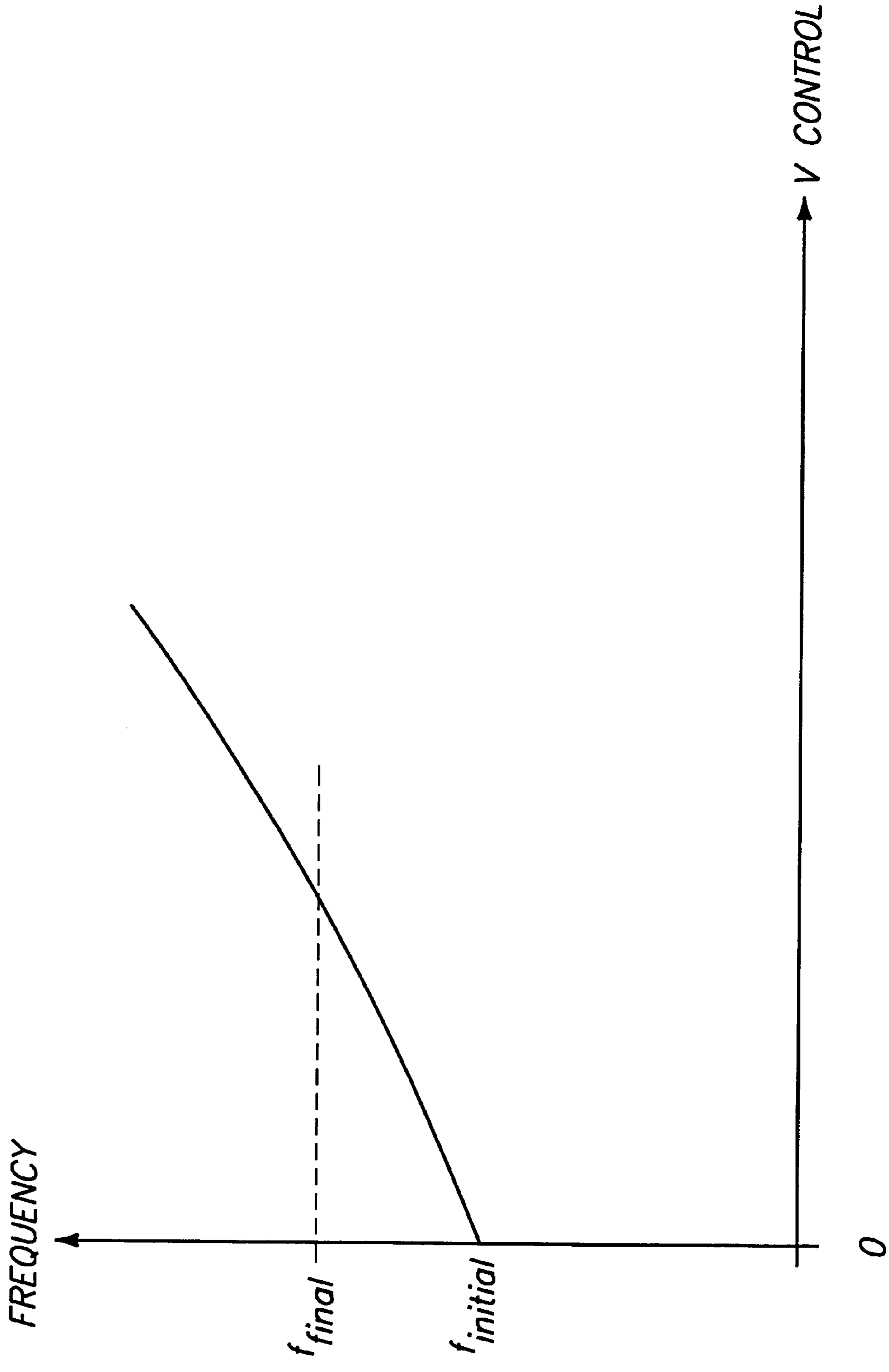

FIG. 62 is a plot of frequency produced by a voltage controlled oscillator versus control voltage applied to the voltage controlled oscillator.

Figure 63:
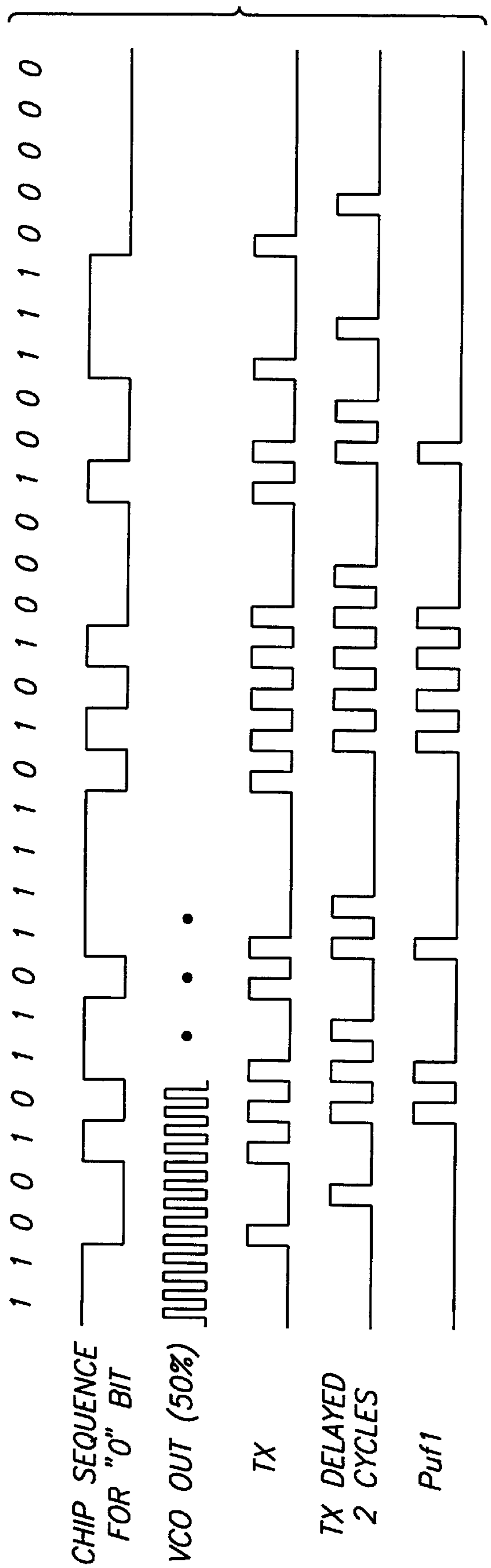

FIG. 63 is a timing diagram showing when the start-up circuit of FIG. 61 issues pump up signals to increase the control voltage applied to the voltage controlled oscillator.

Figure 64:
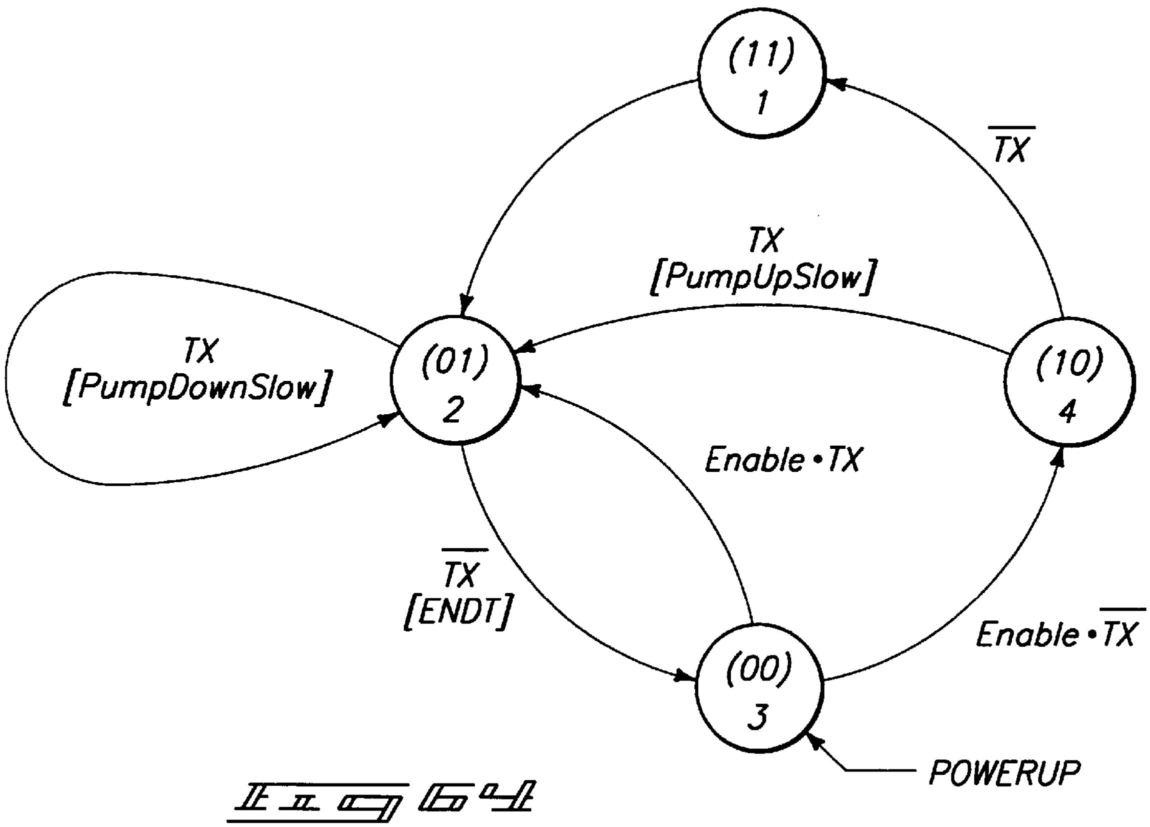

FIG. 64 is a state diagram illustrating the design of the state machine of FIG. 61.

Figure 65:
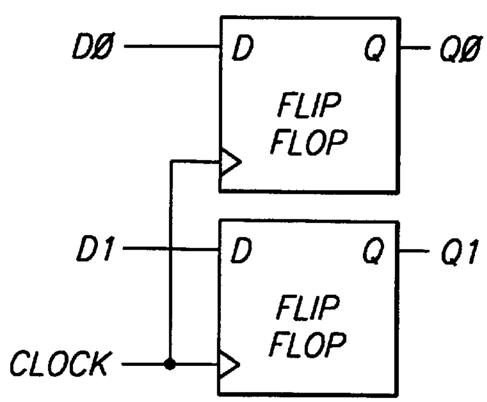
Figure 67:
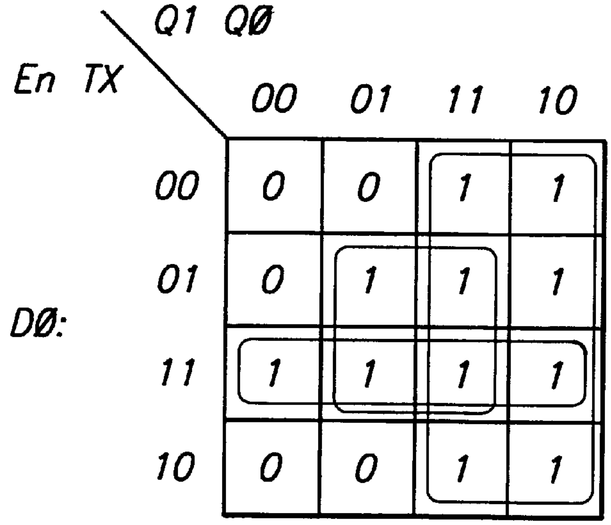
Figure 68:
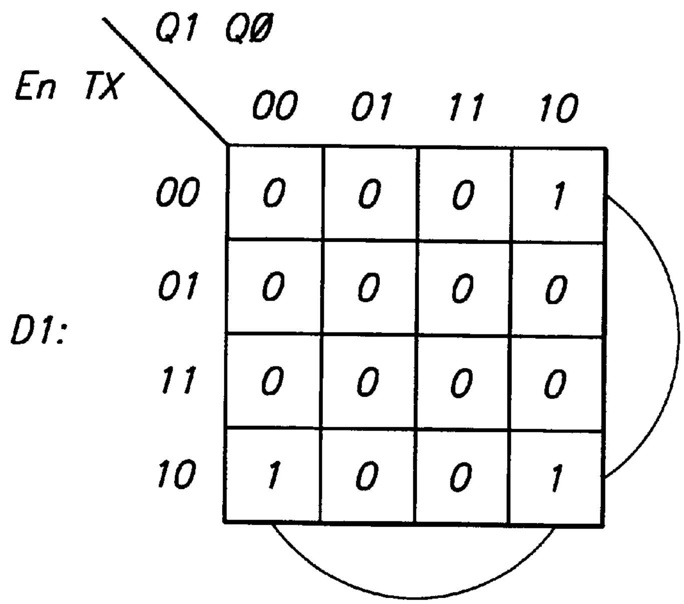

FIGS. 65–70 illustrate steps used in designing a state machine that implements the state diagram of FIG. 64. FIG. 65 illustrates flip-flops having outputs representing in binary form the various states of the state diagrams and having inputs representing next state values. FIG. 66 is a state table. FIGS. 67 and 68 are Karnaugh maps used to derive minimum logic circuitry needed to derive circuit output functions and flip-flop input functions.

Figure 71:
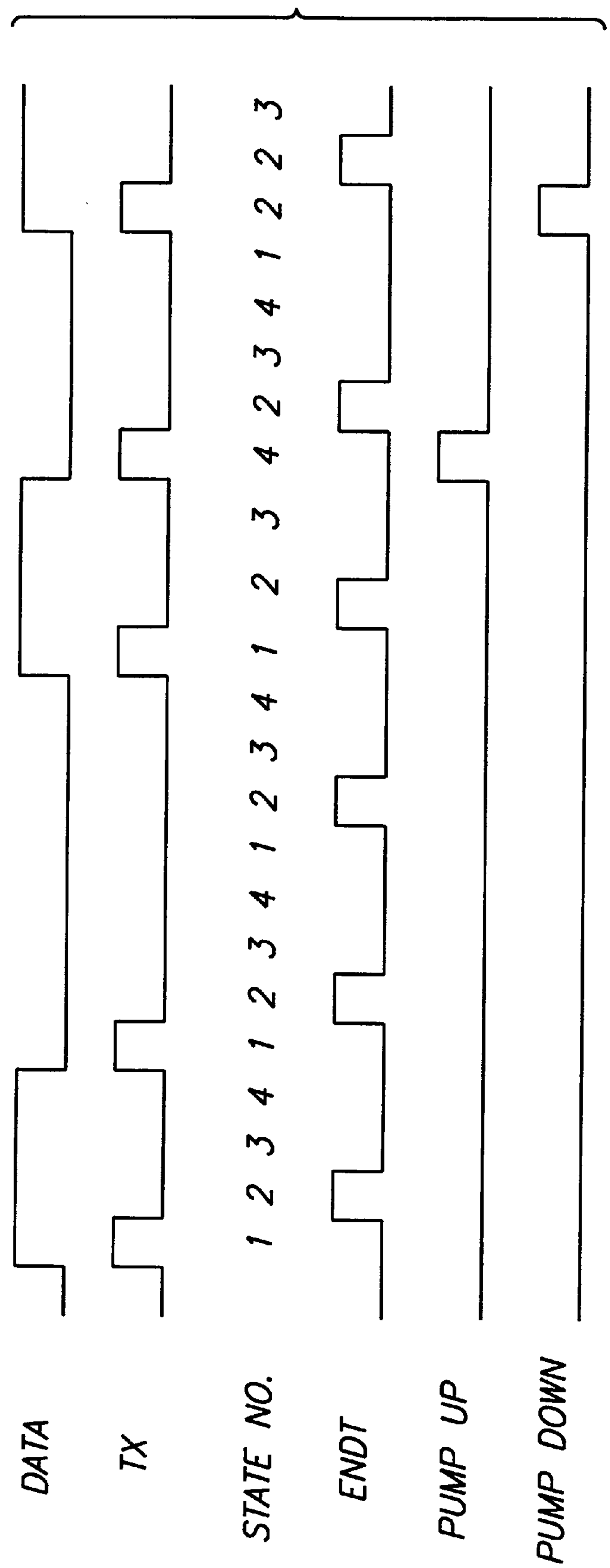

FIG. 71 is a simplified timing diagram illustrating operation of the state machine.

Figure 72H:
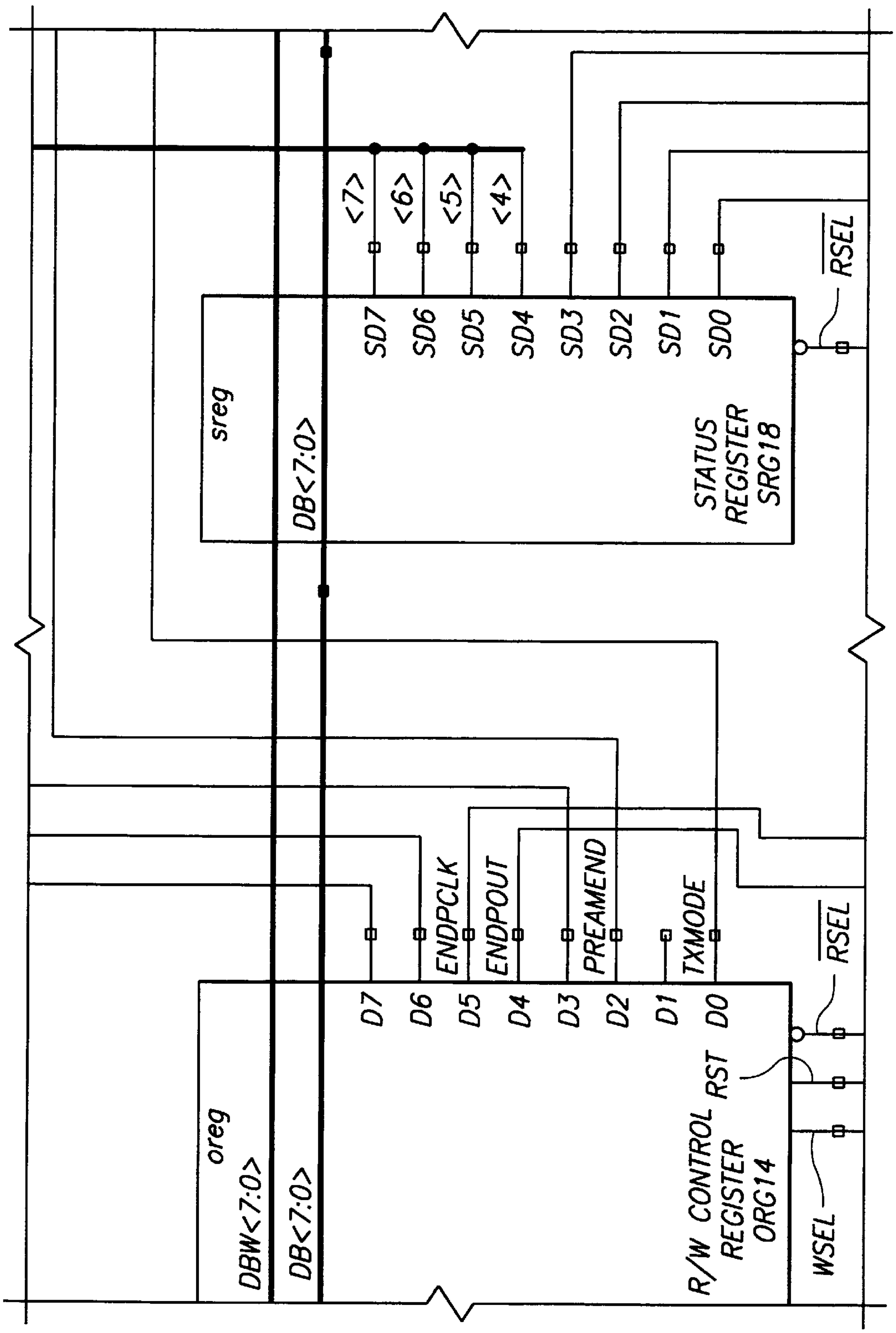
Figure 71C:
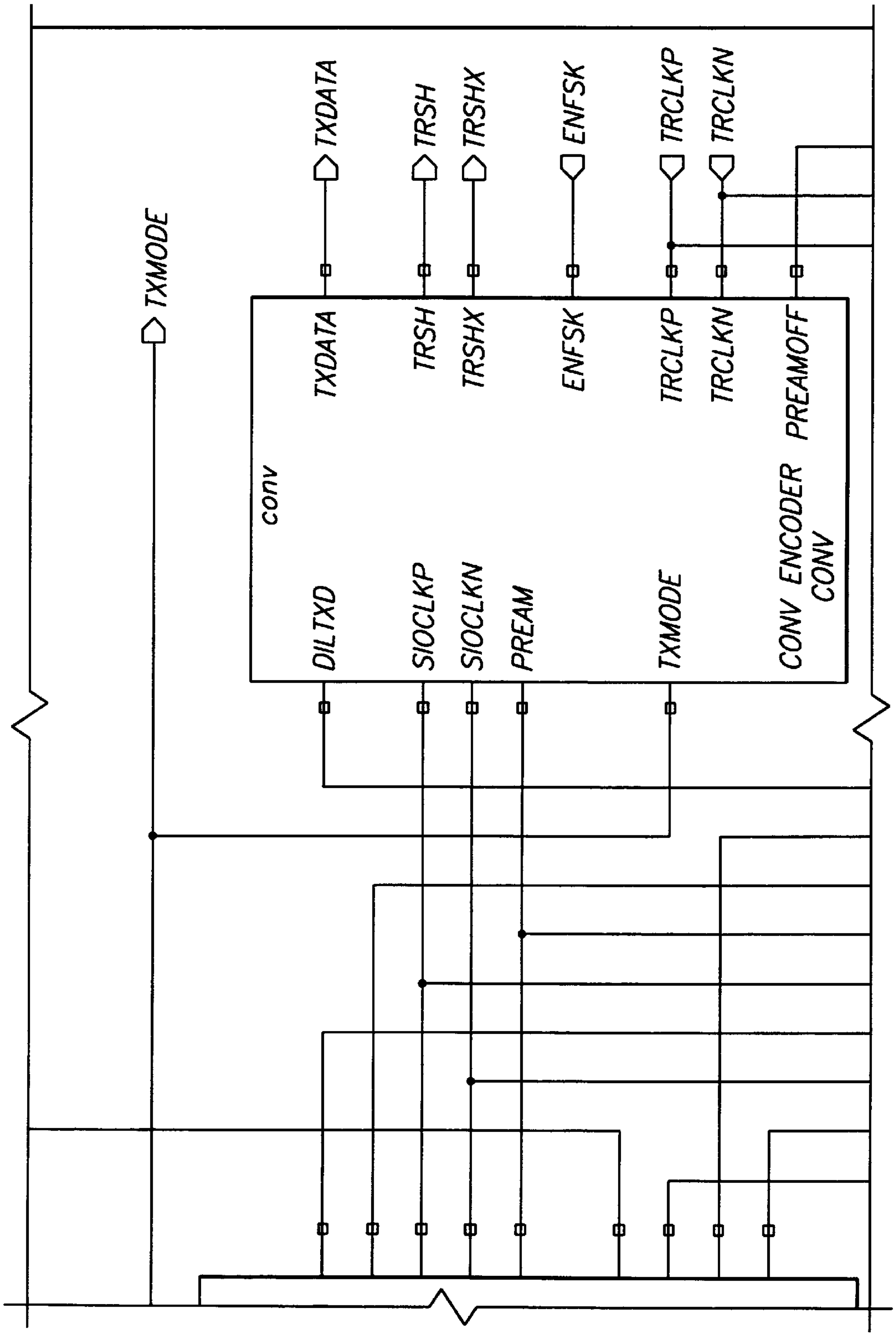
Figure 11D:
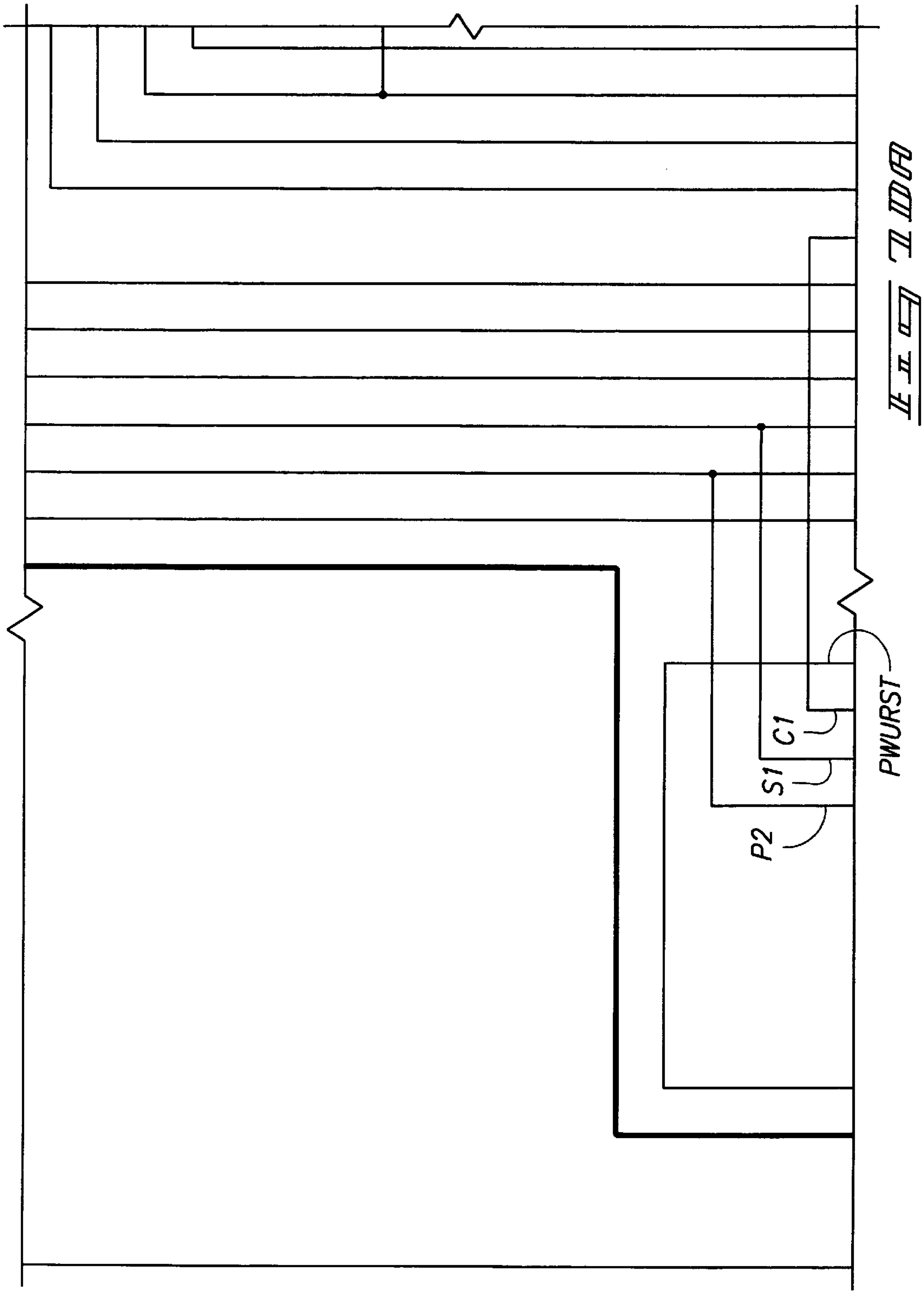
Figure 7D:
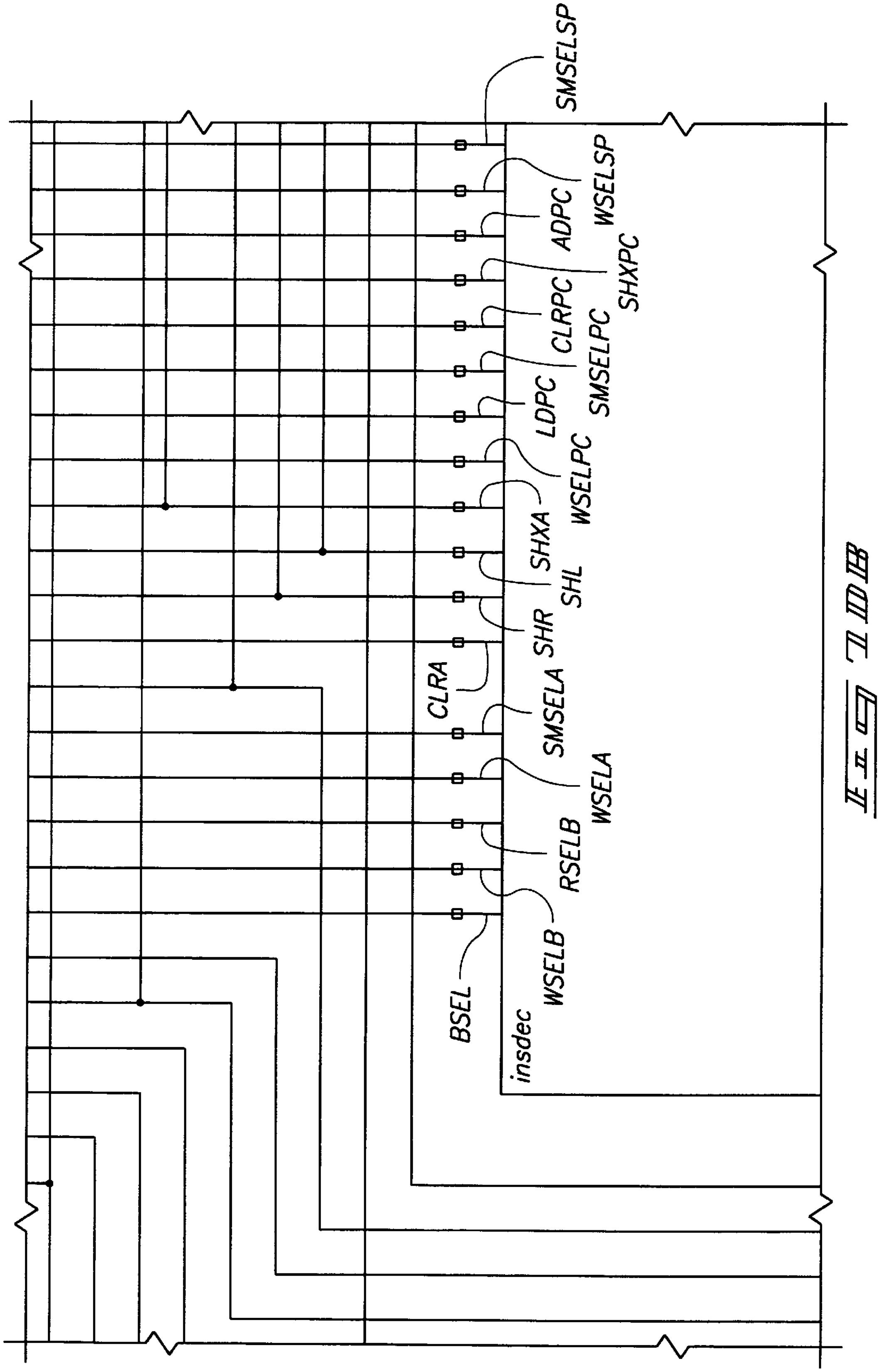
Figure 7D:
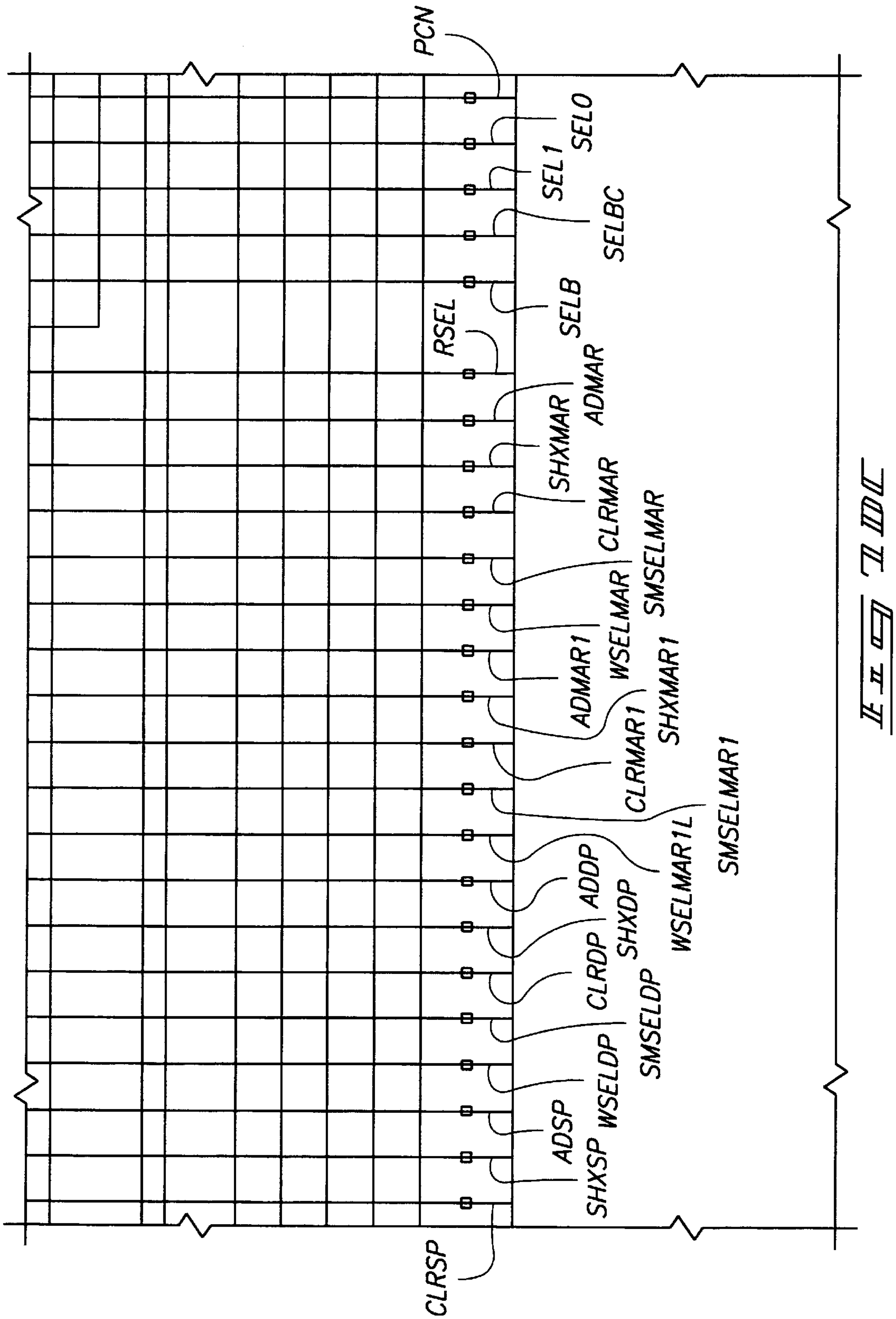
Figure 7D:
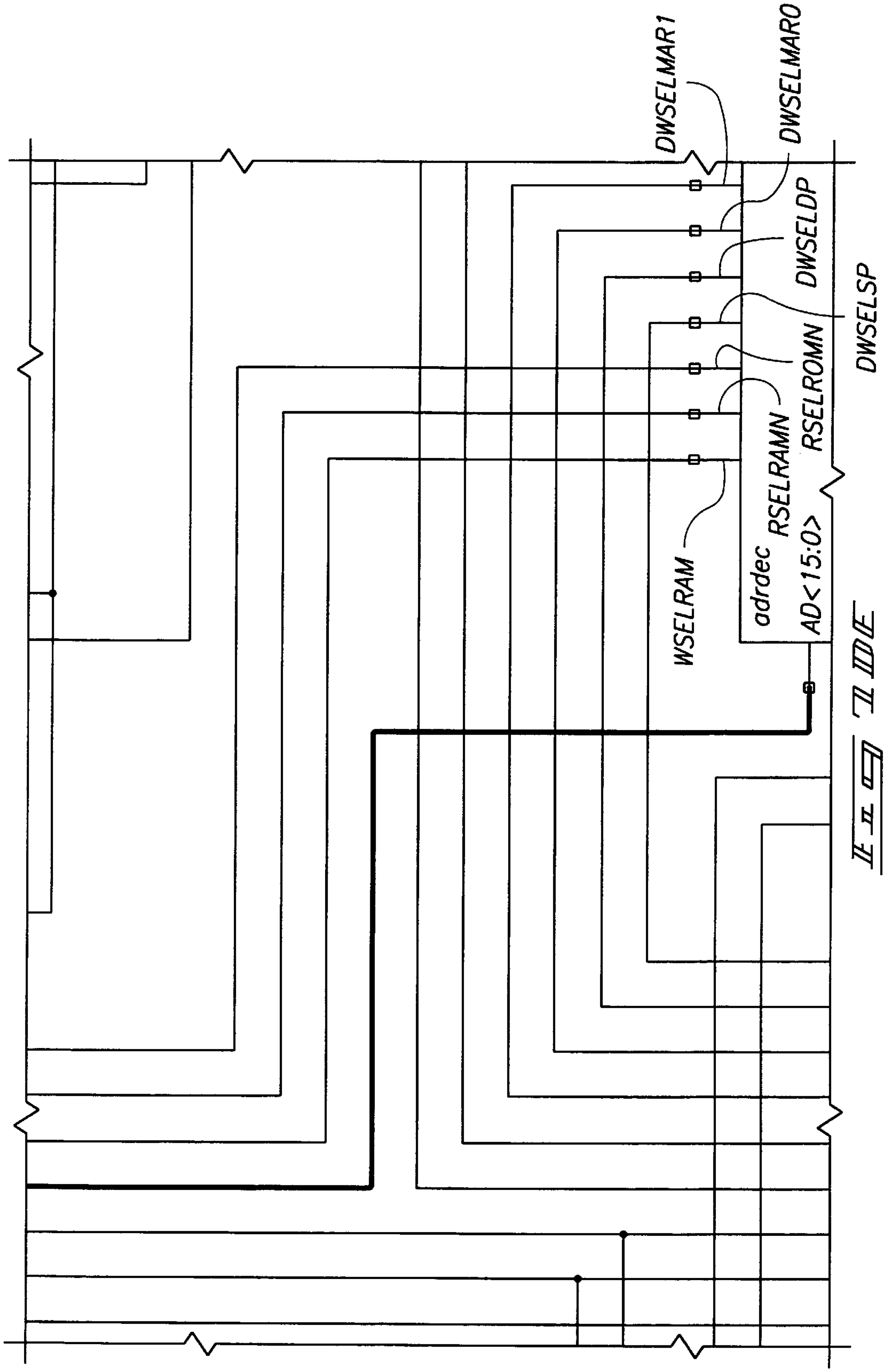
Figure 7D:
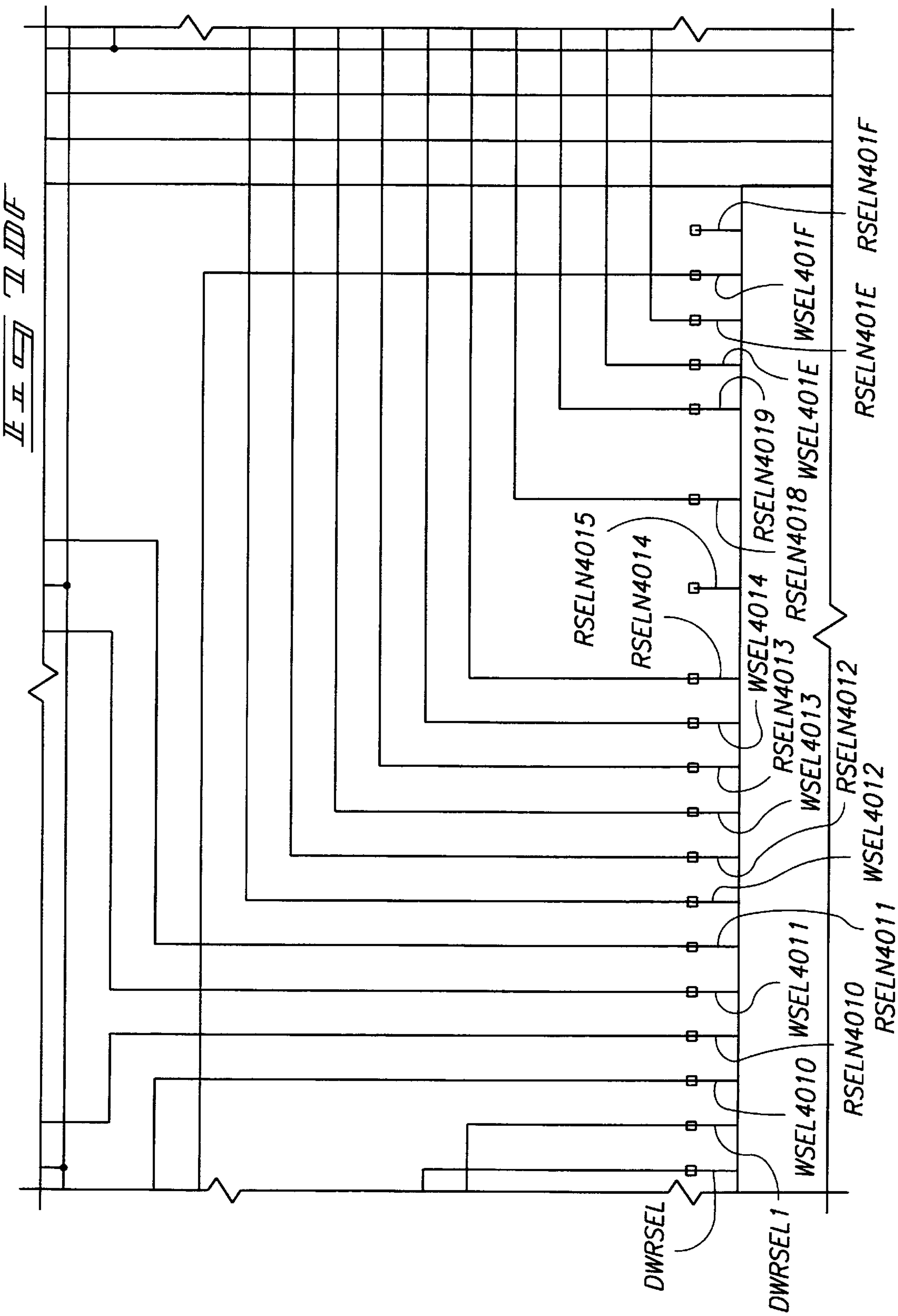
Figure 7D:
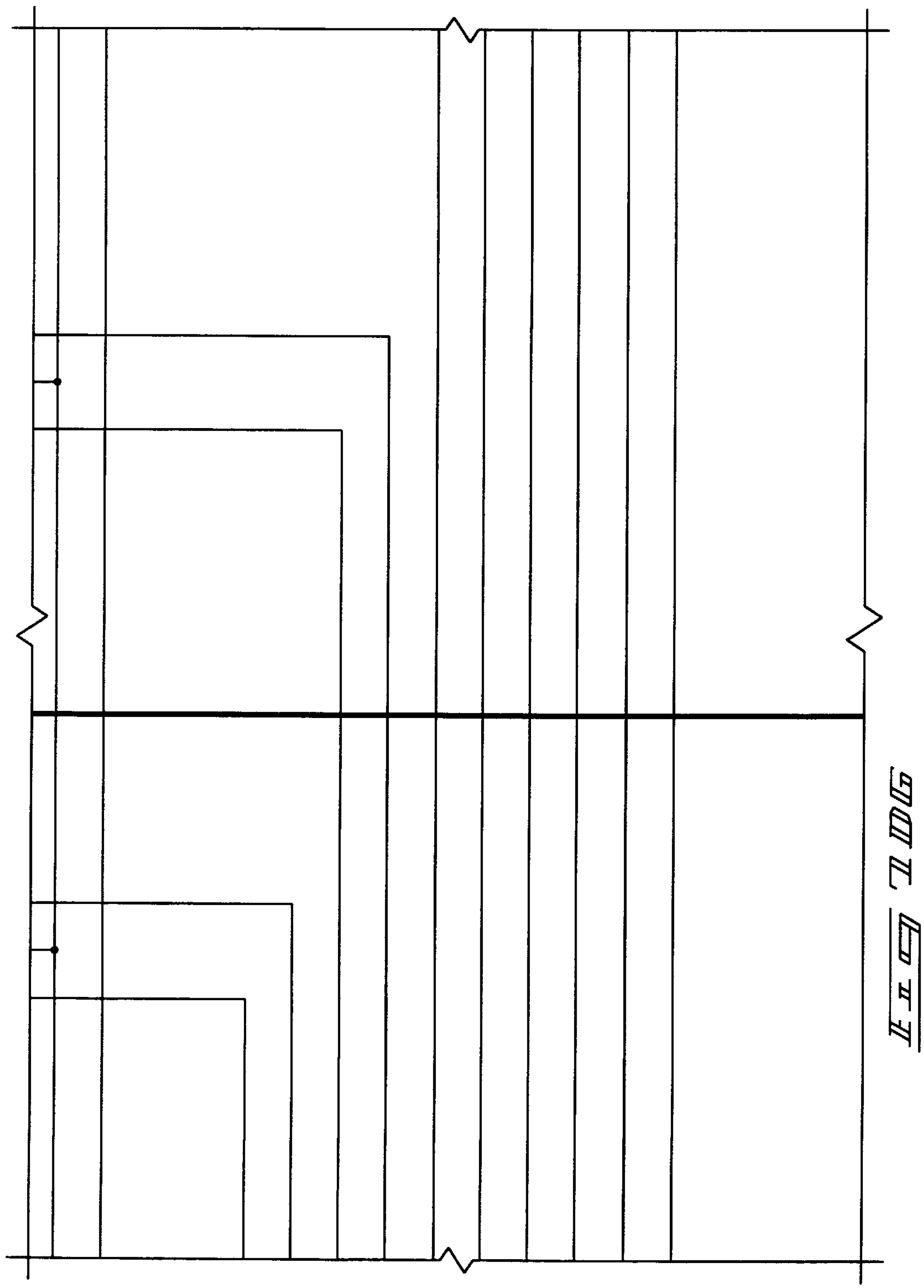
Figure 7D:
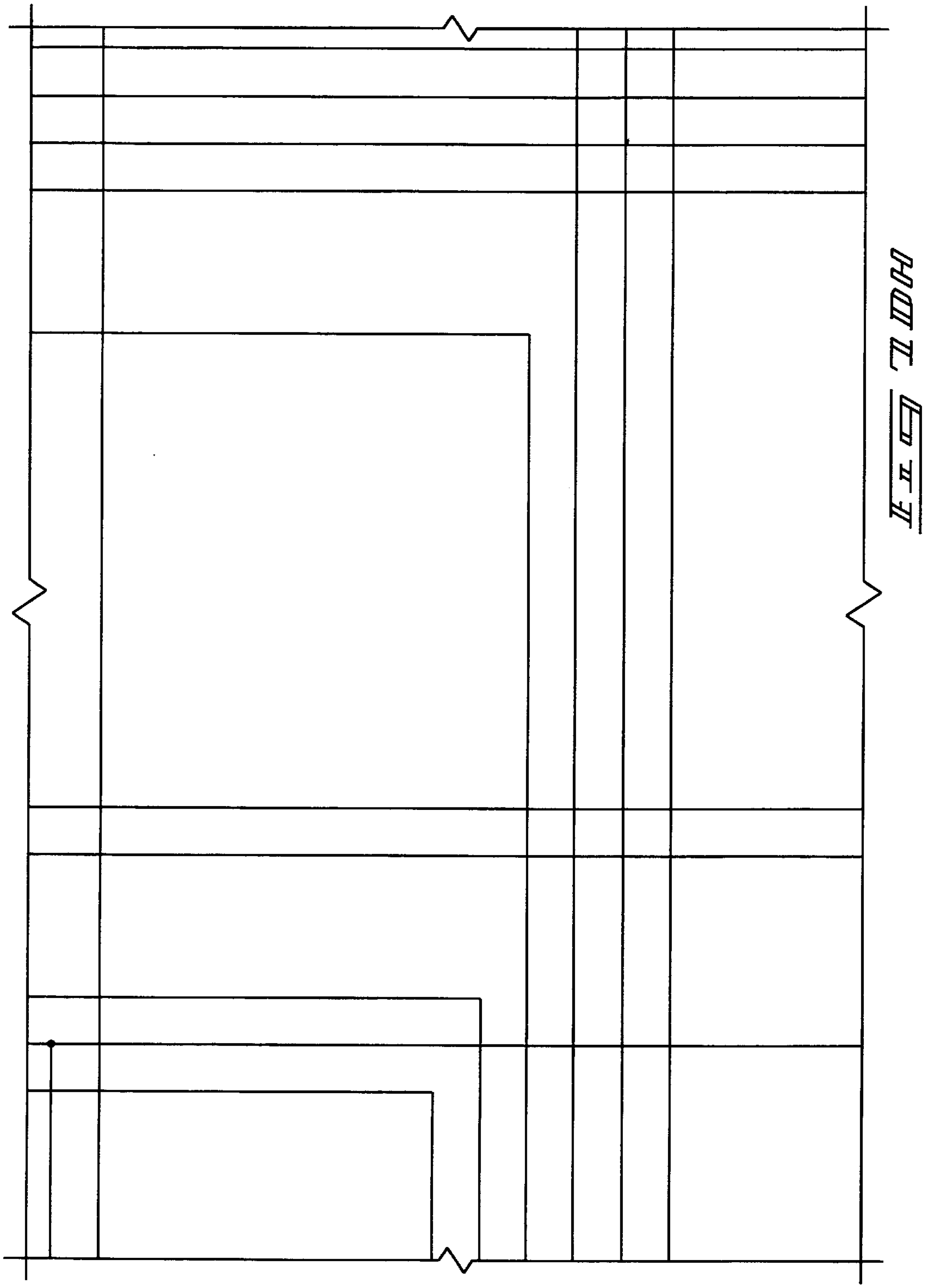
Figure 7D:
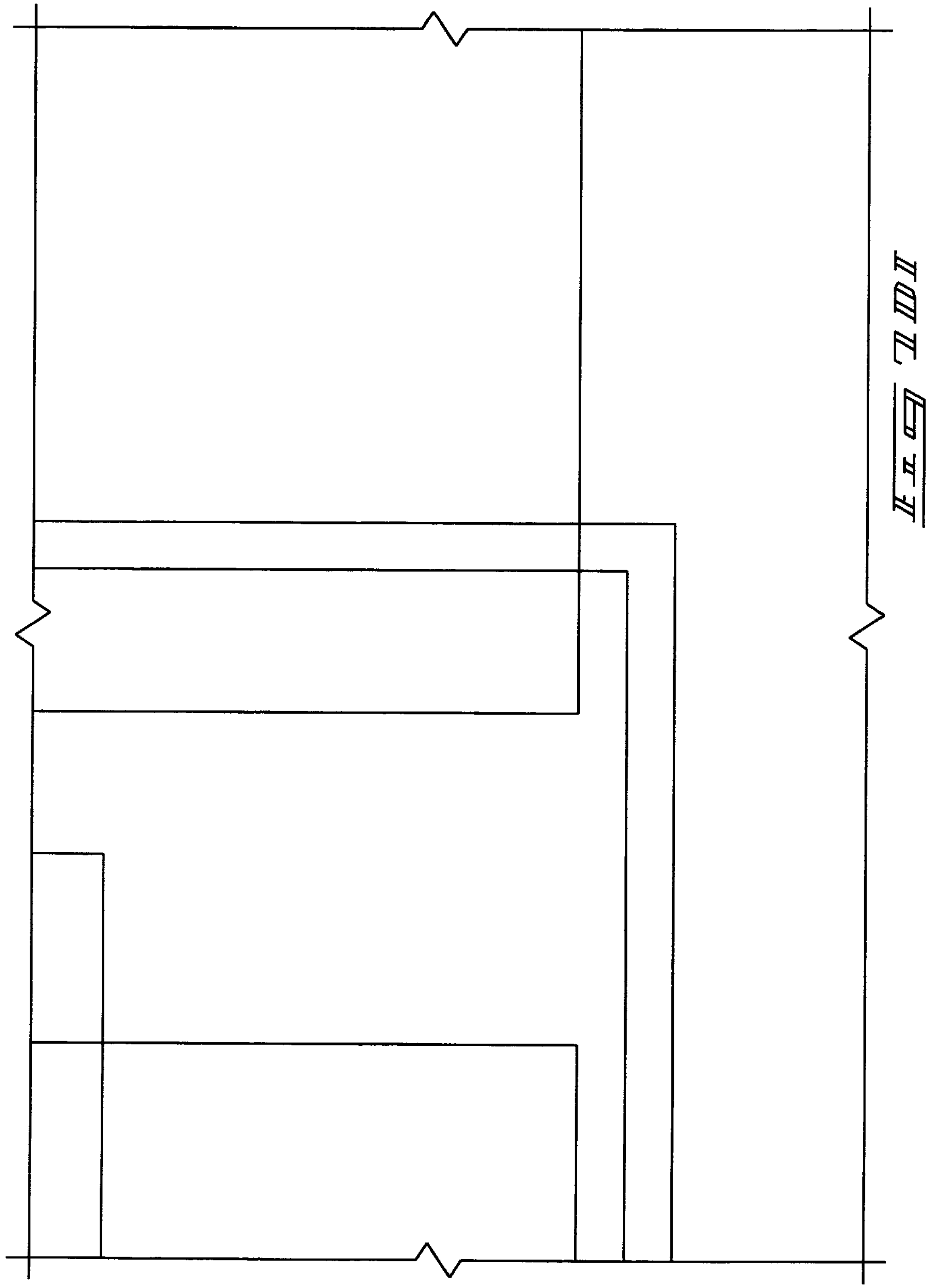
Figure 7D:
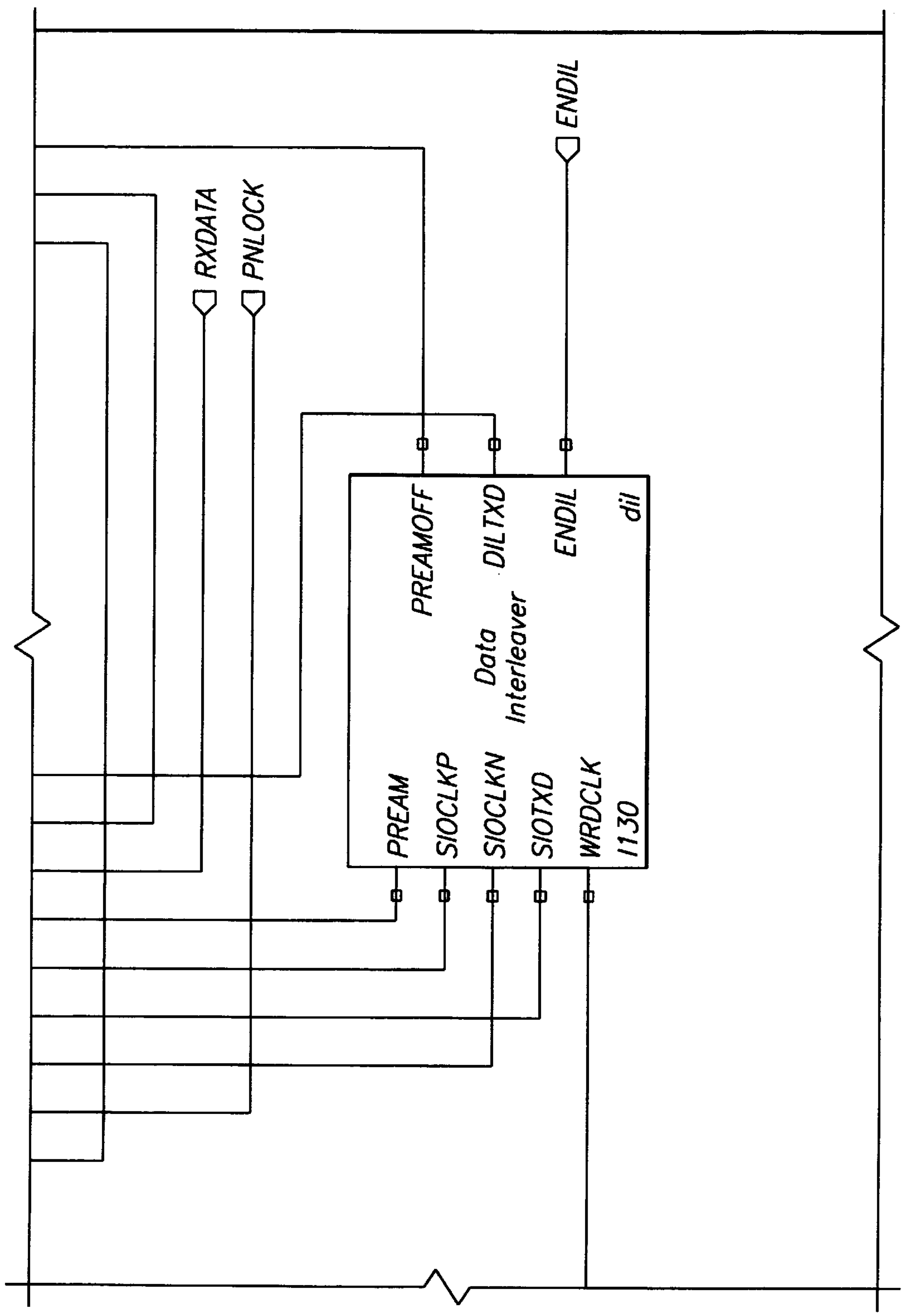
Figure 76A:
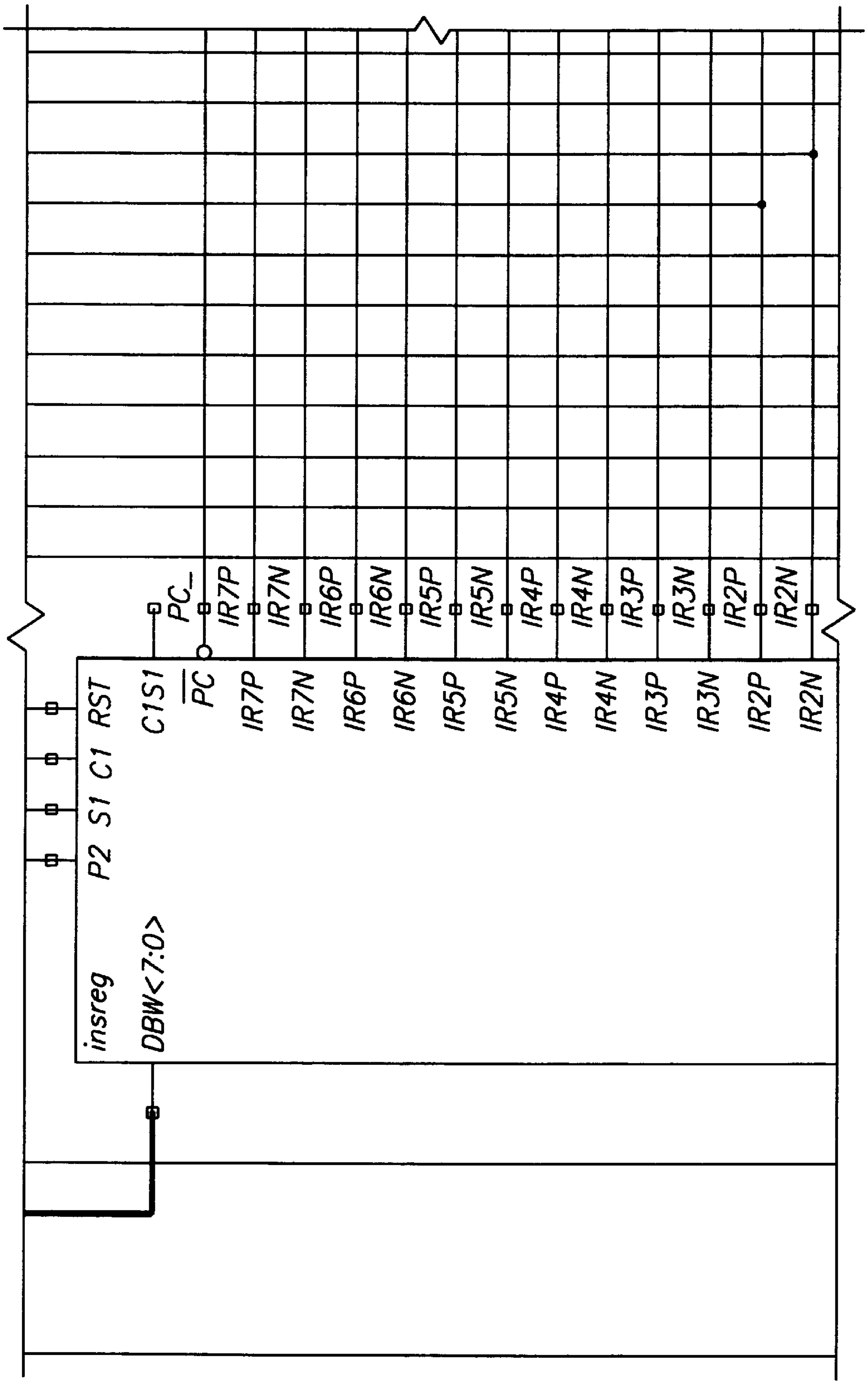
Figure 7E:
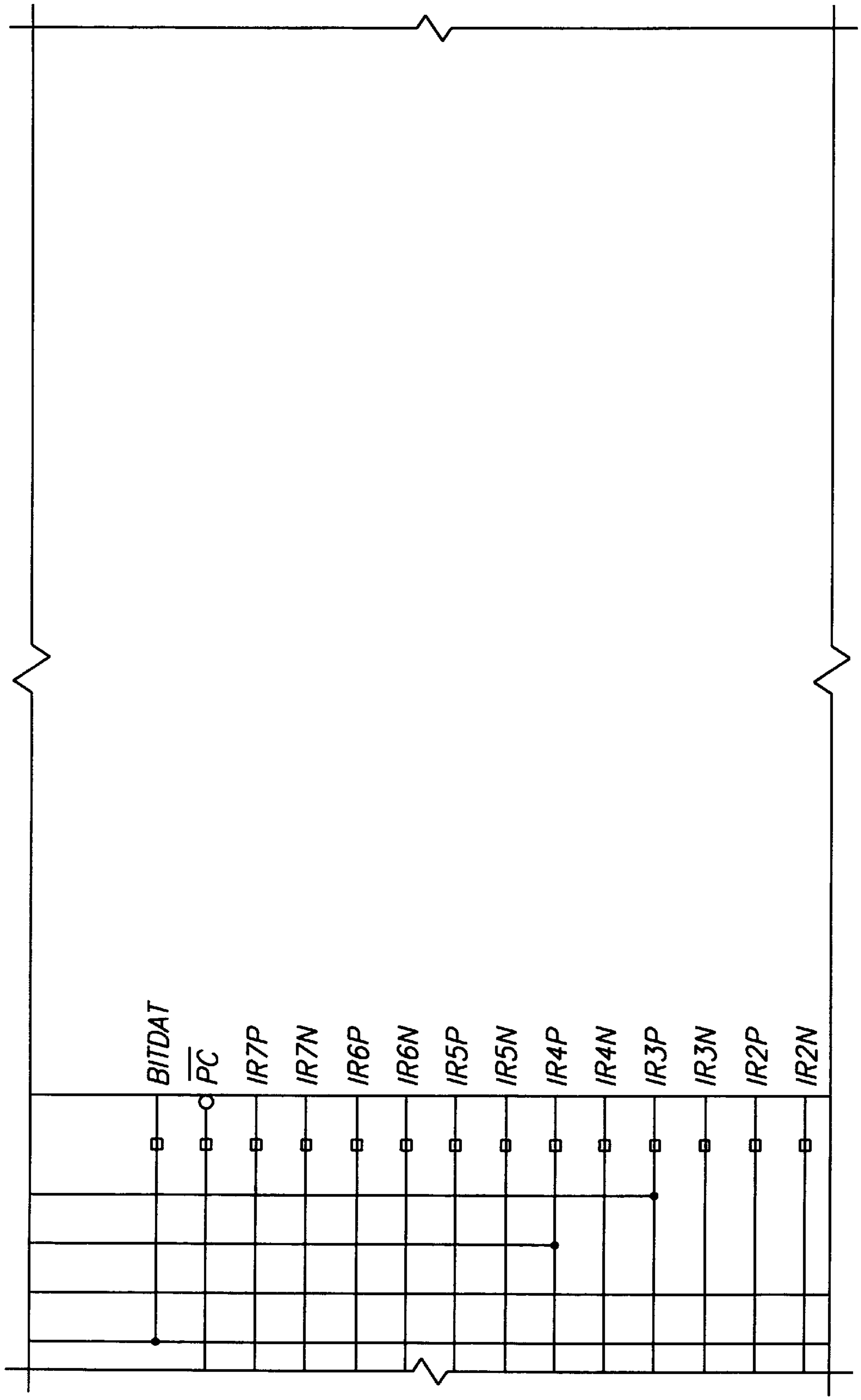
Figure 1E:
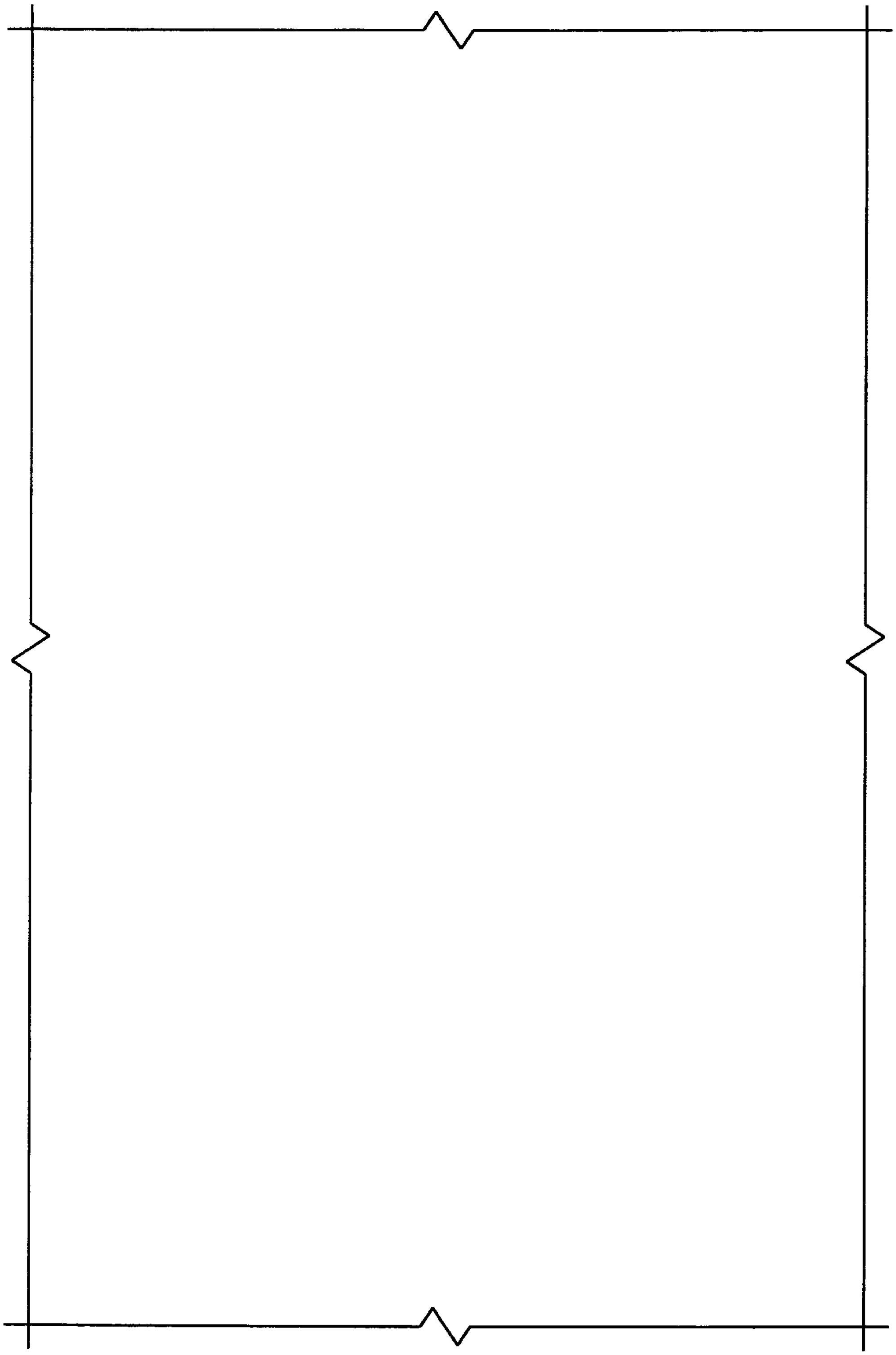
Figure 7E:
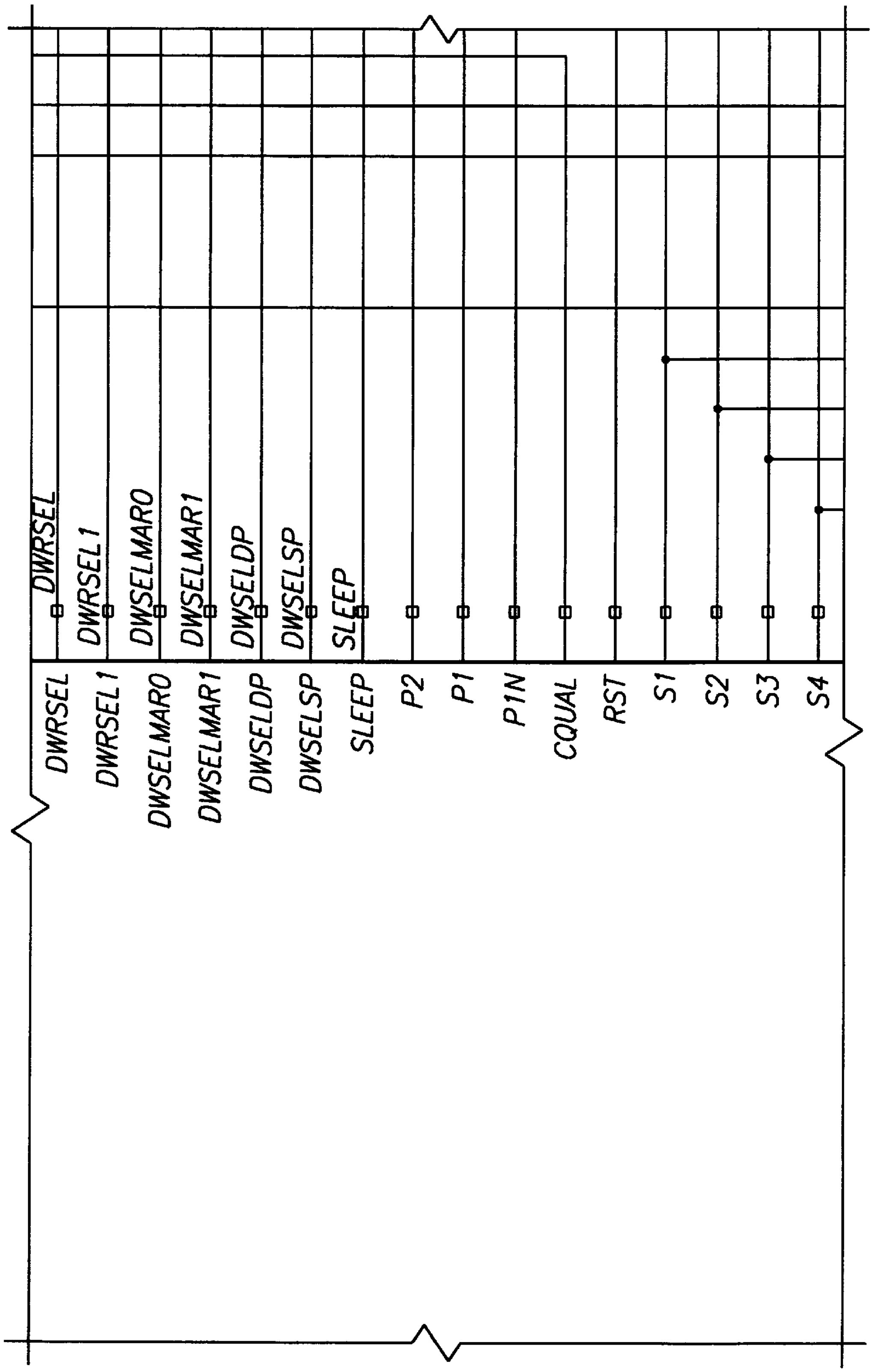
Figure 7E:
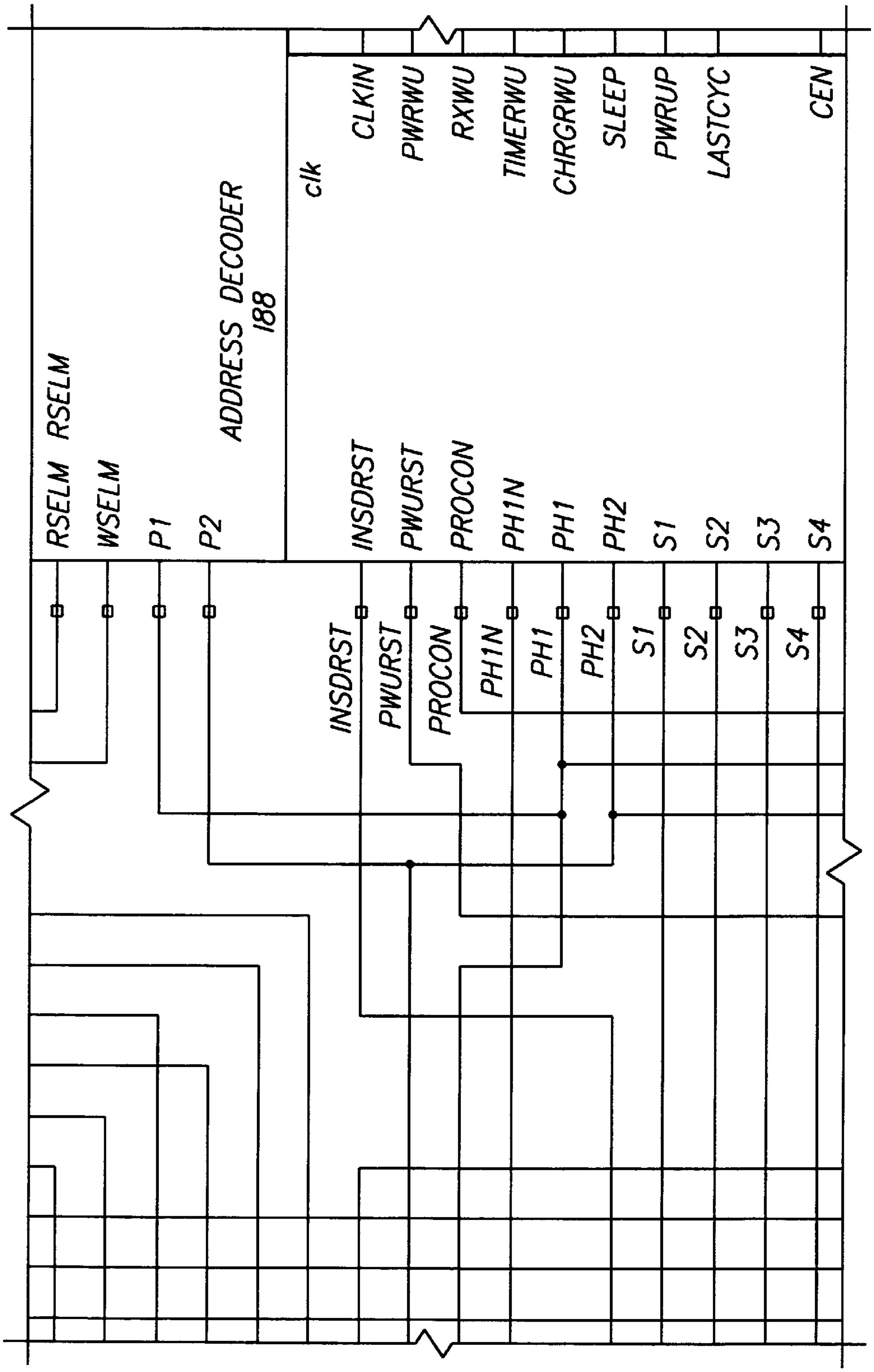
Figure 7E:
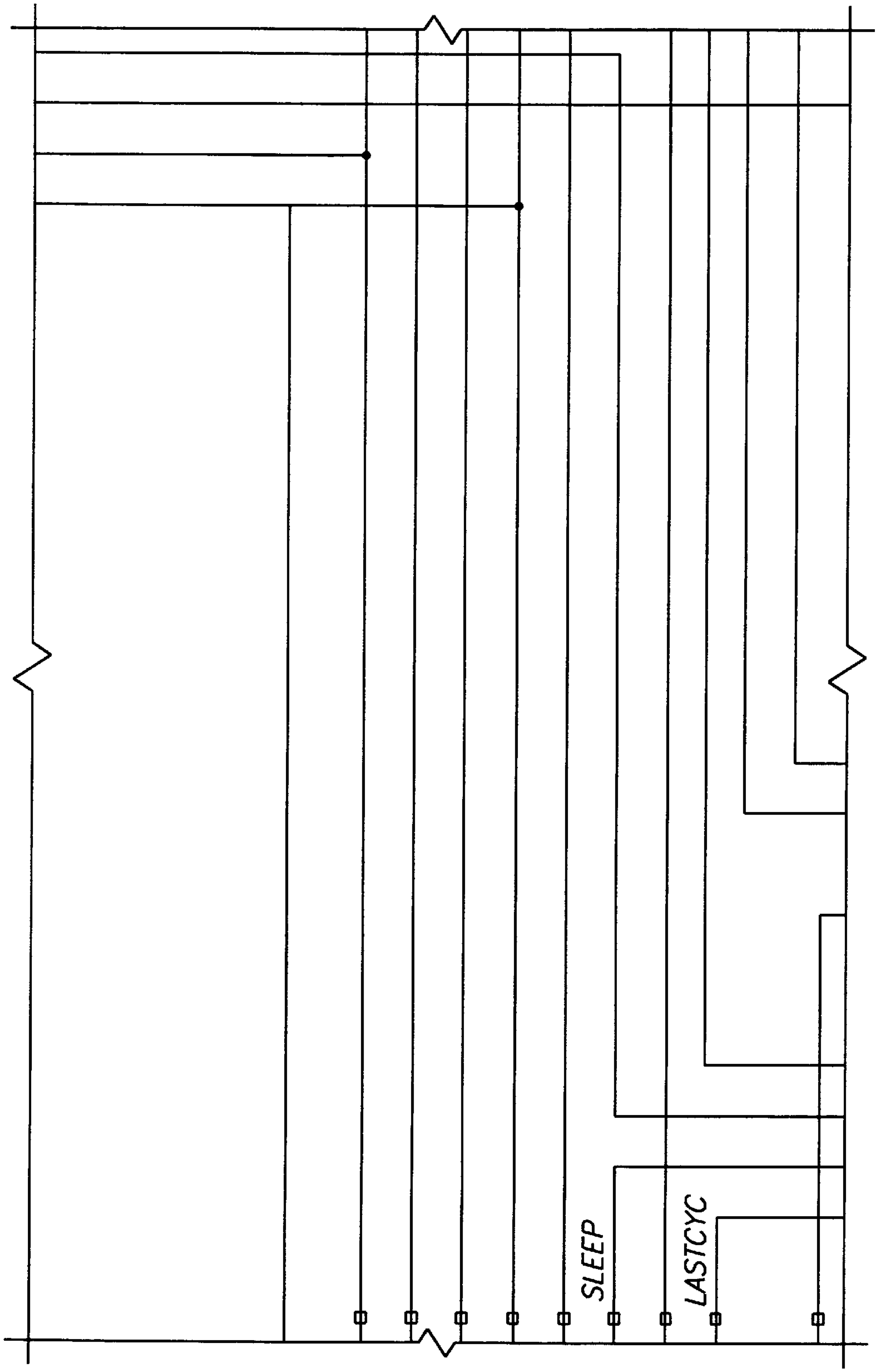
Figure 7E:
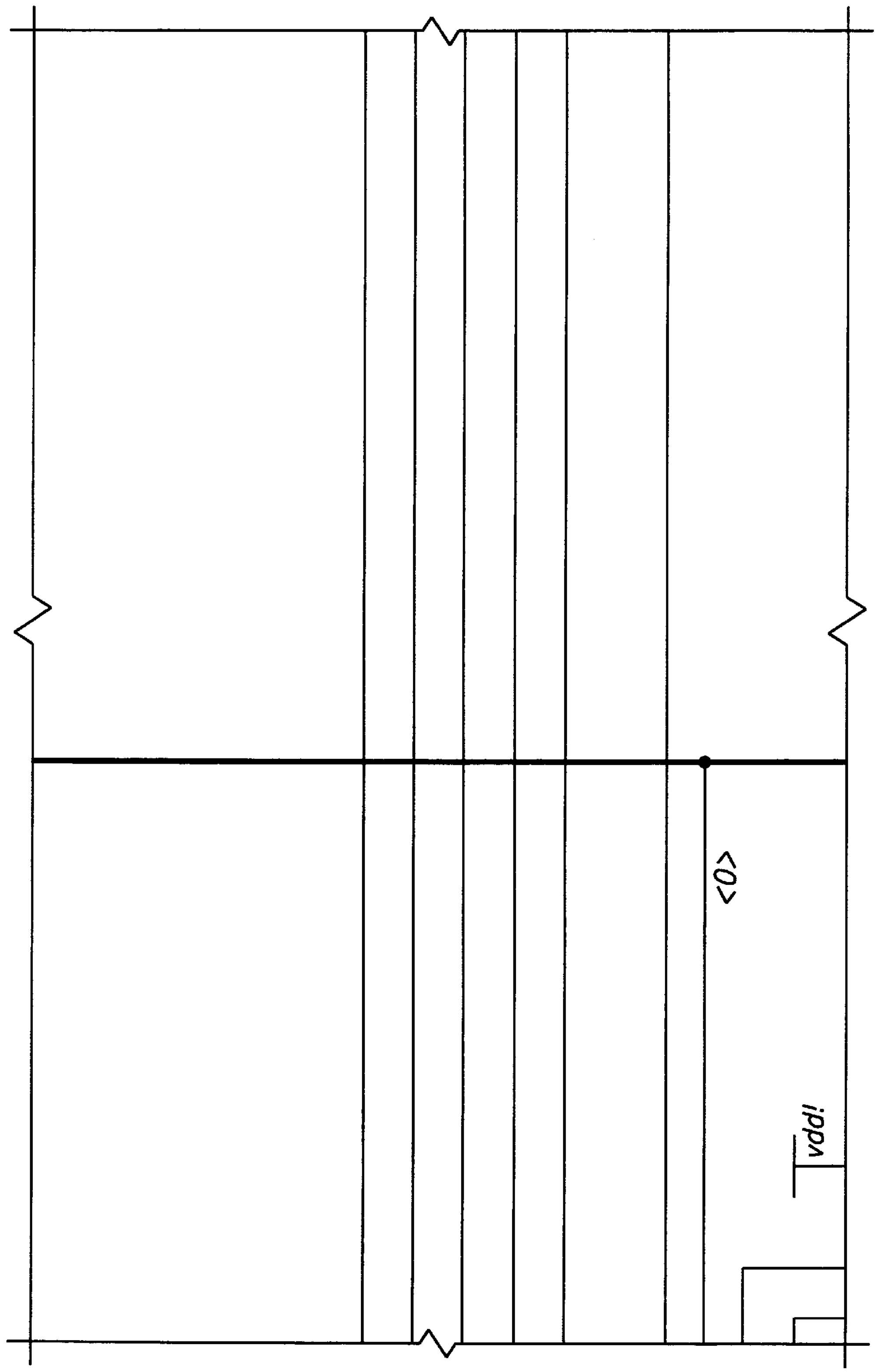
Figure 7E:
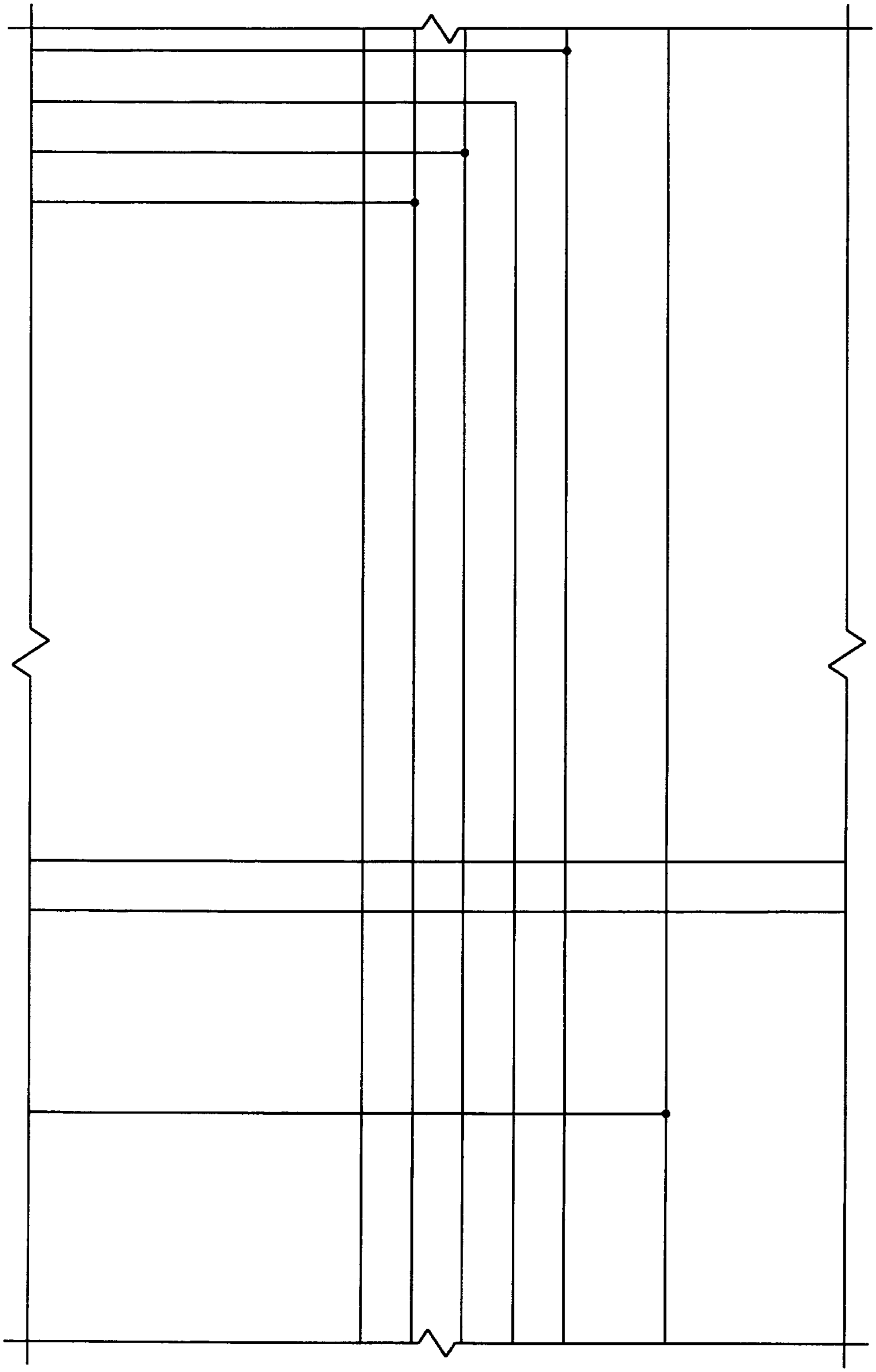
Figure 7E:
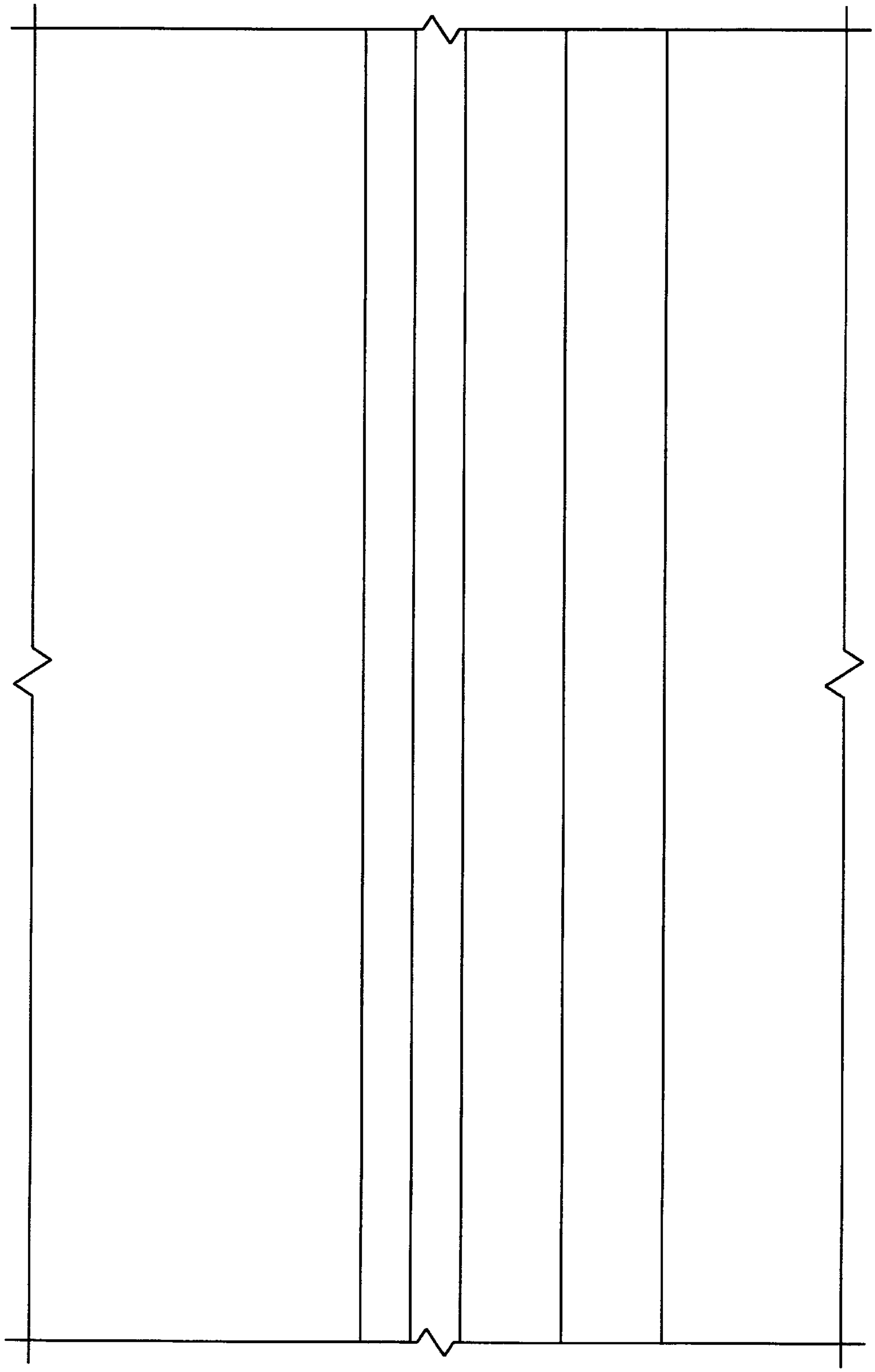
Figure 7E:
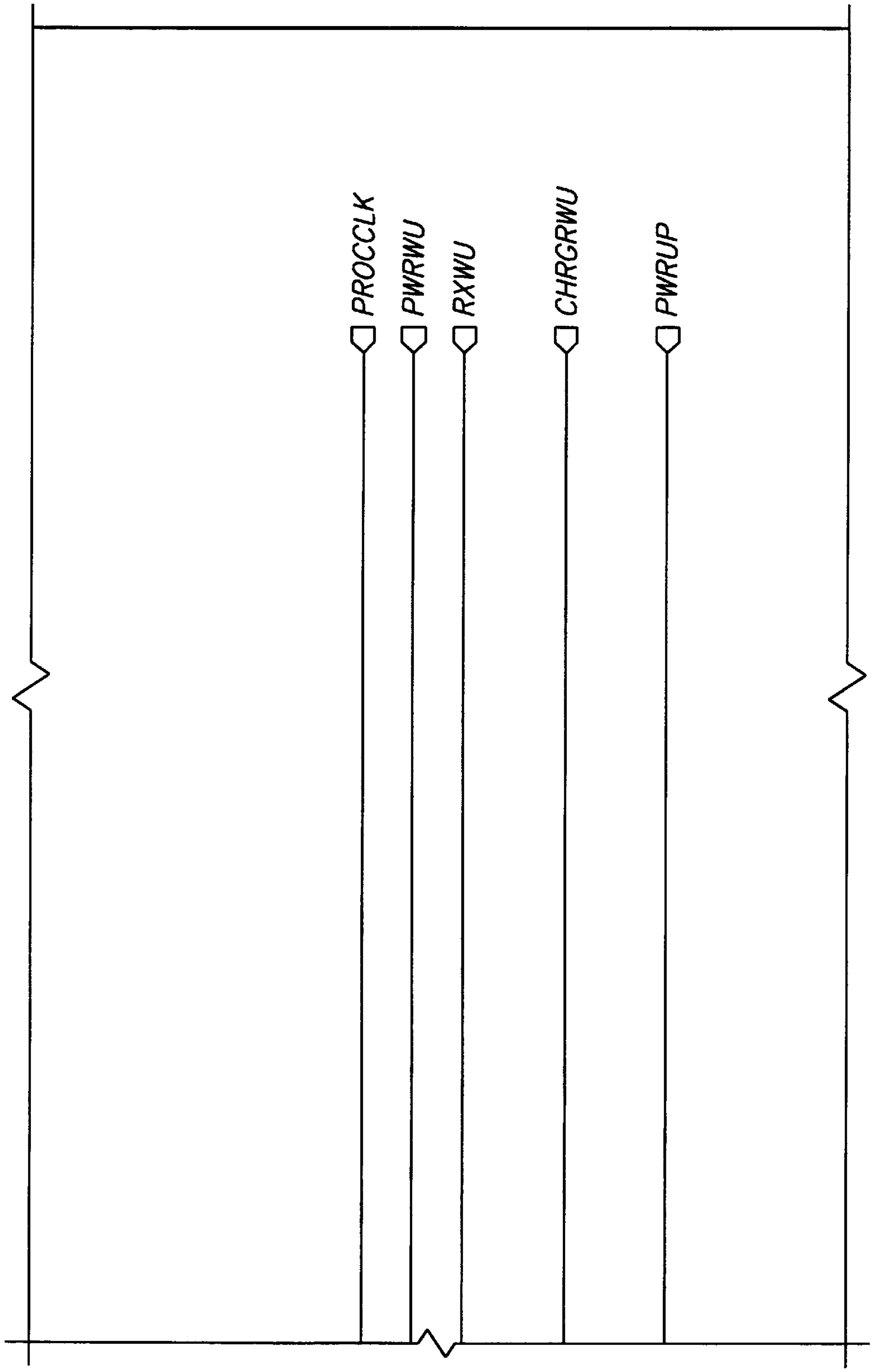
Figure 71A:
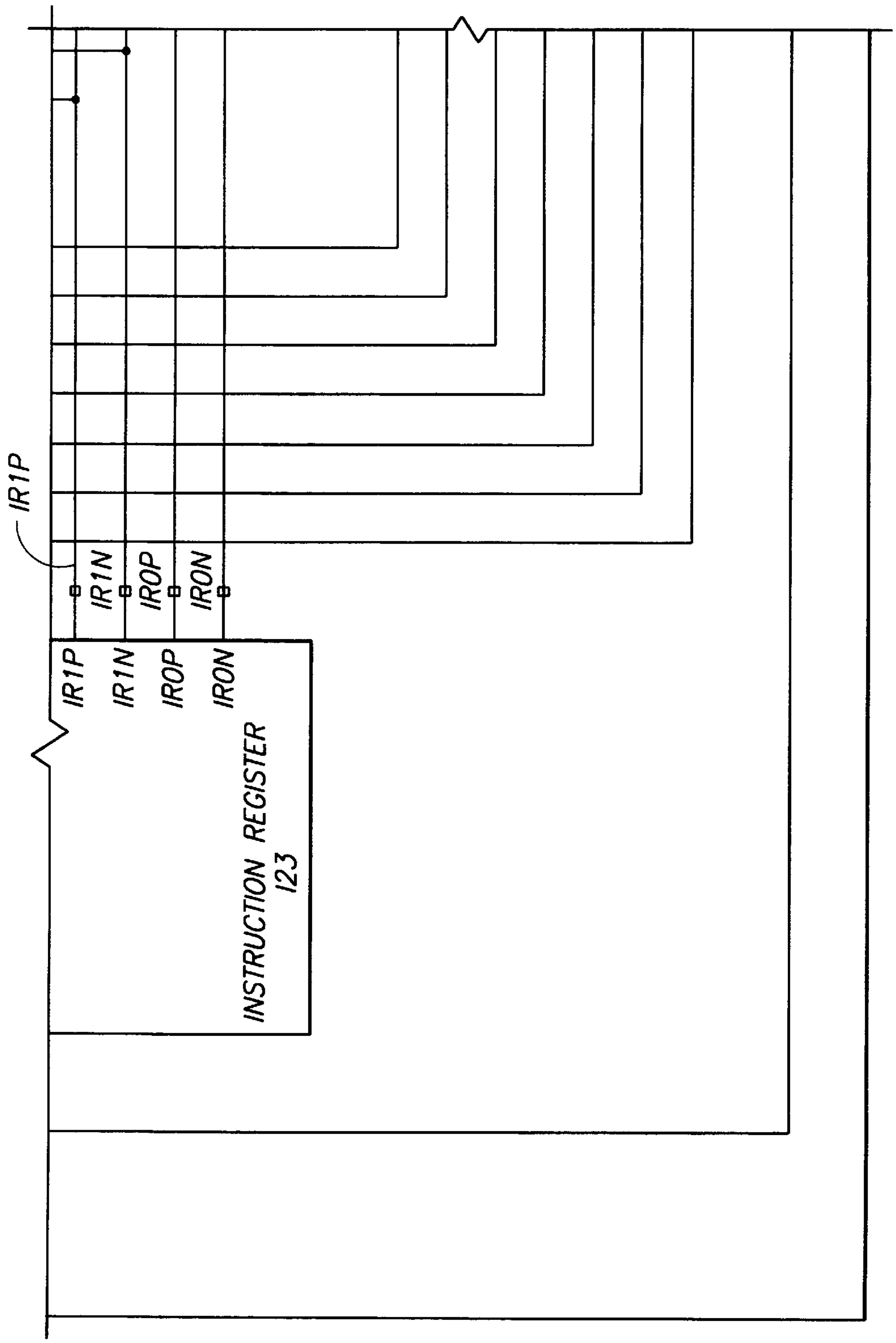
Figure 7F:
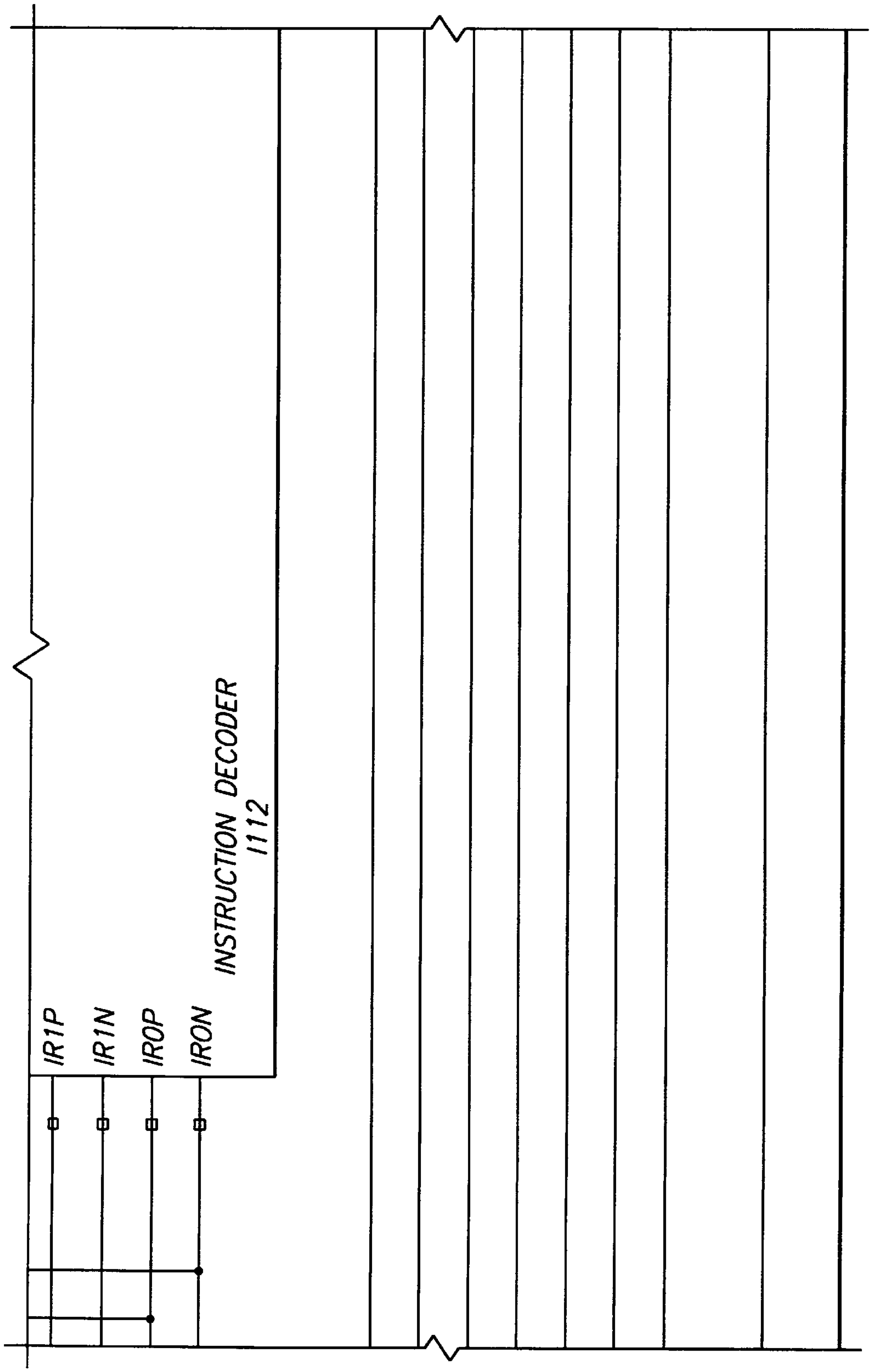
Figure 7F:
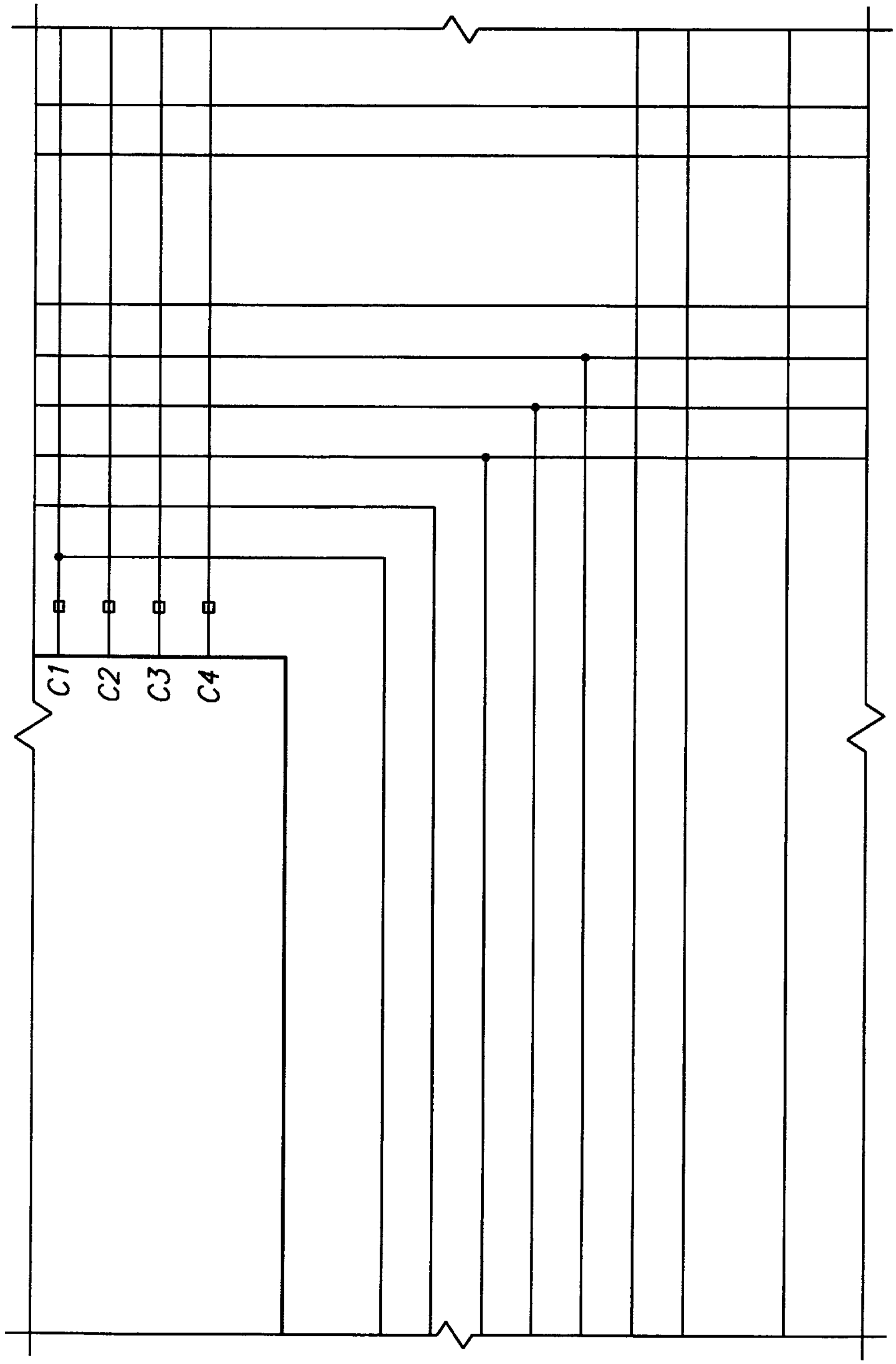
Figure 11F:
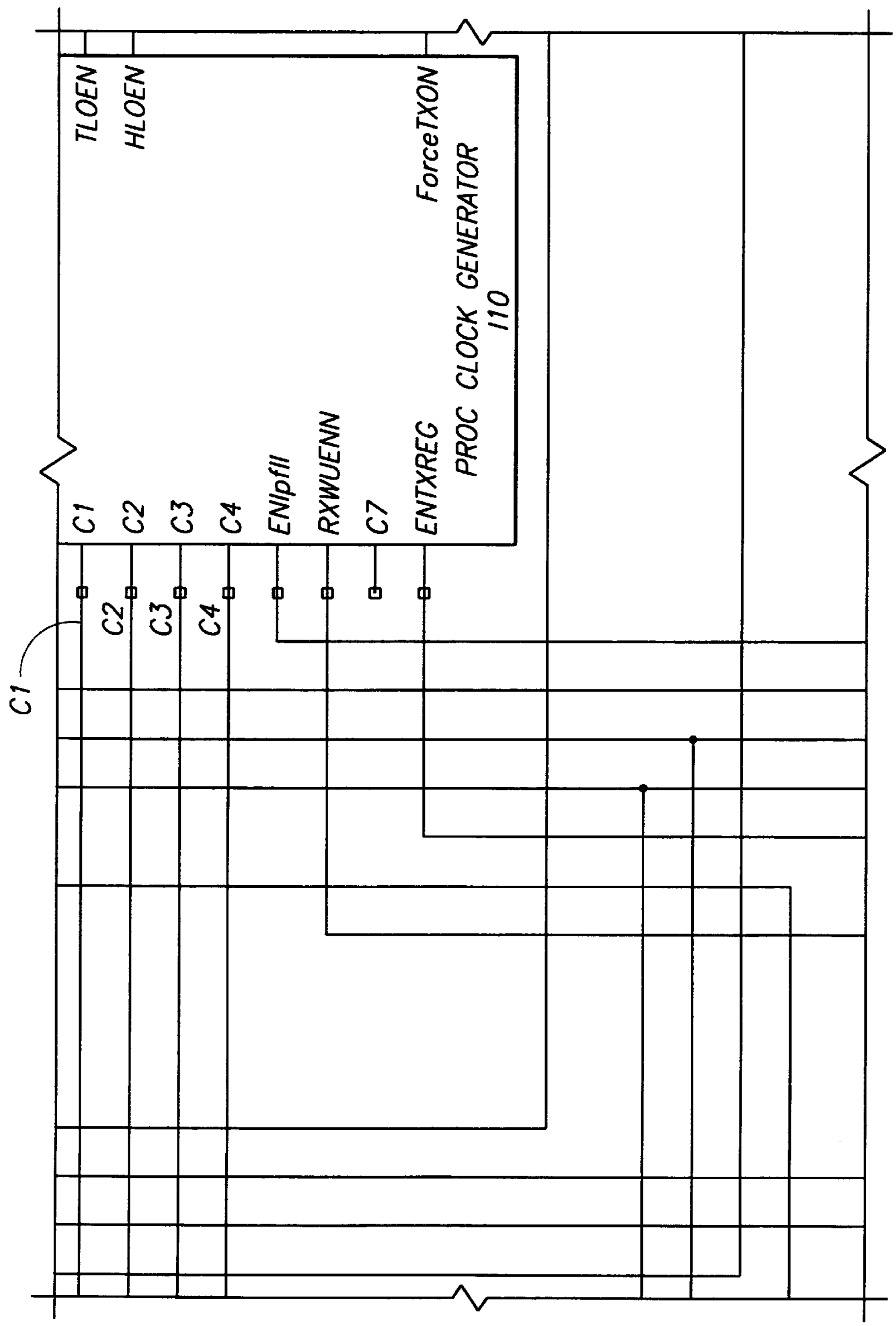
Figure 1F:
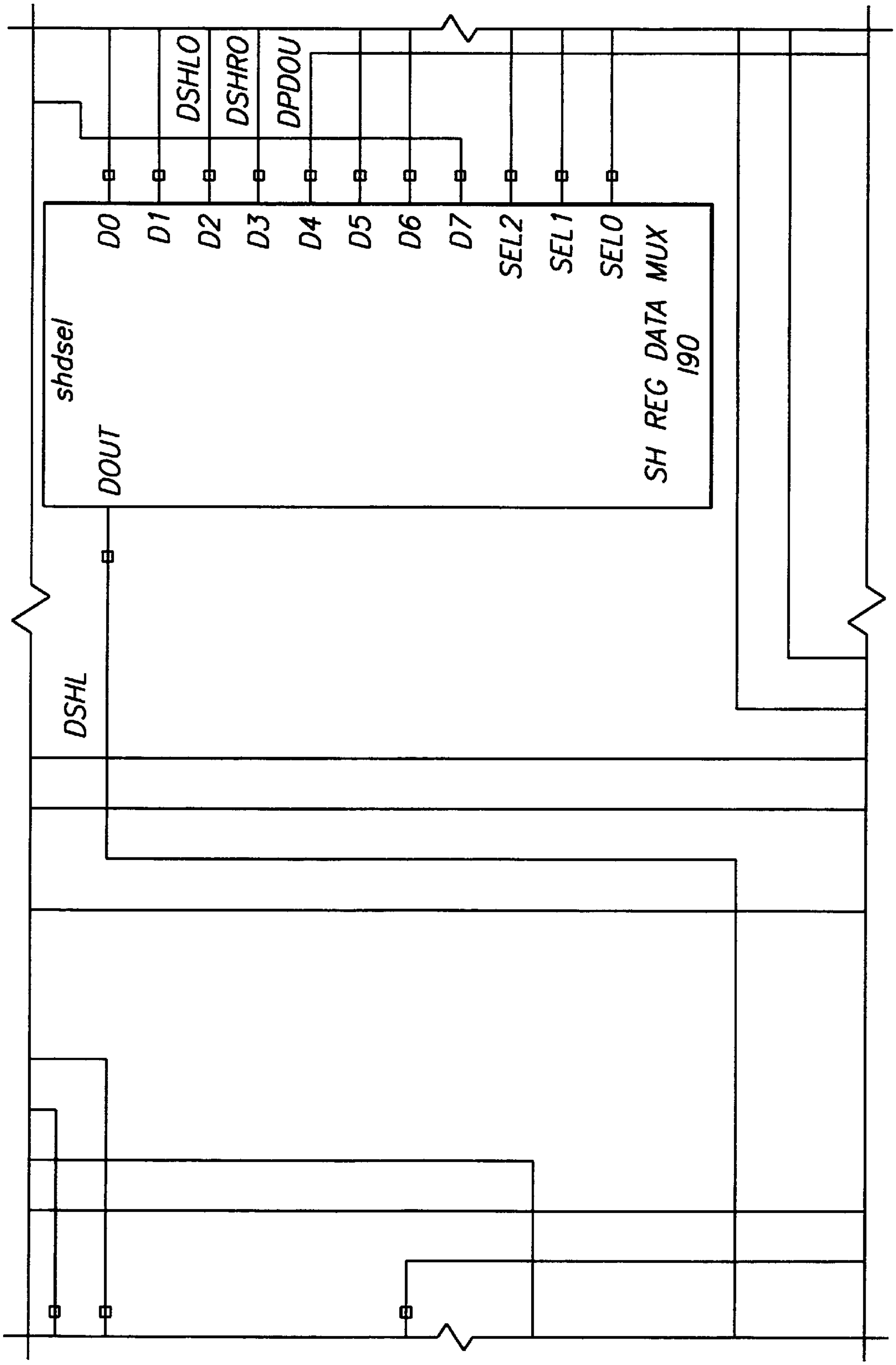
Figure 7F:
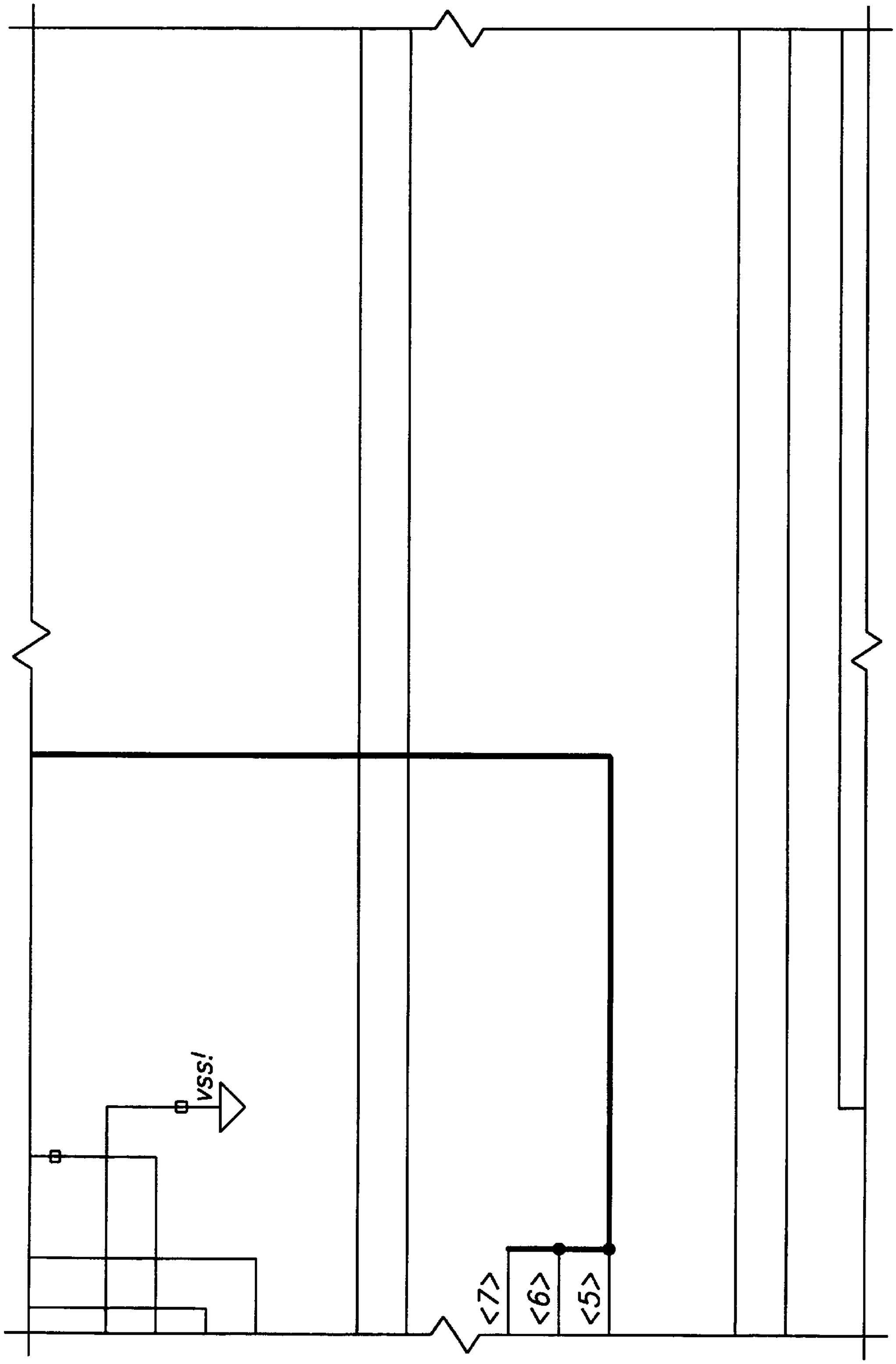
Figure 7F:
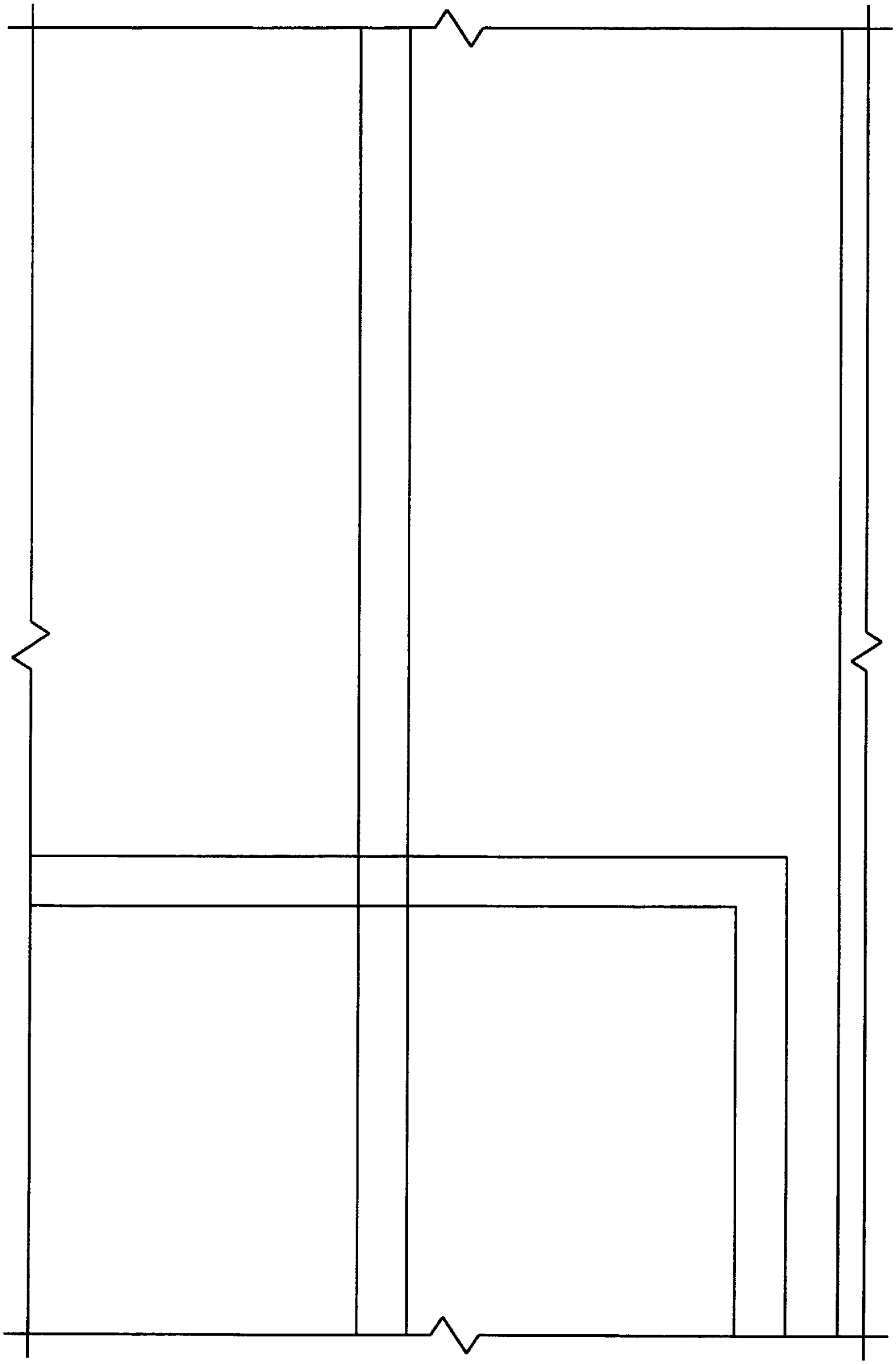
Figure 7F:
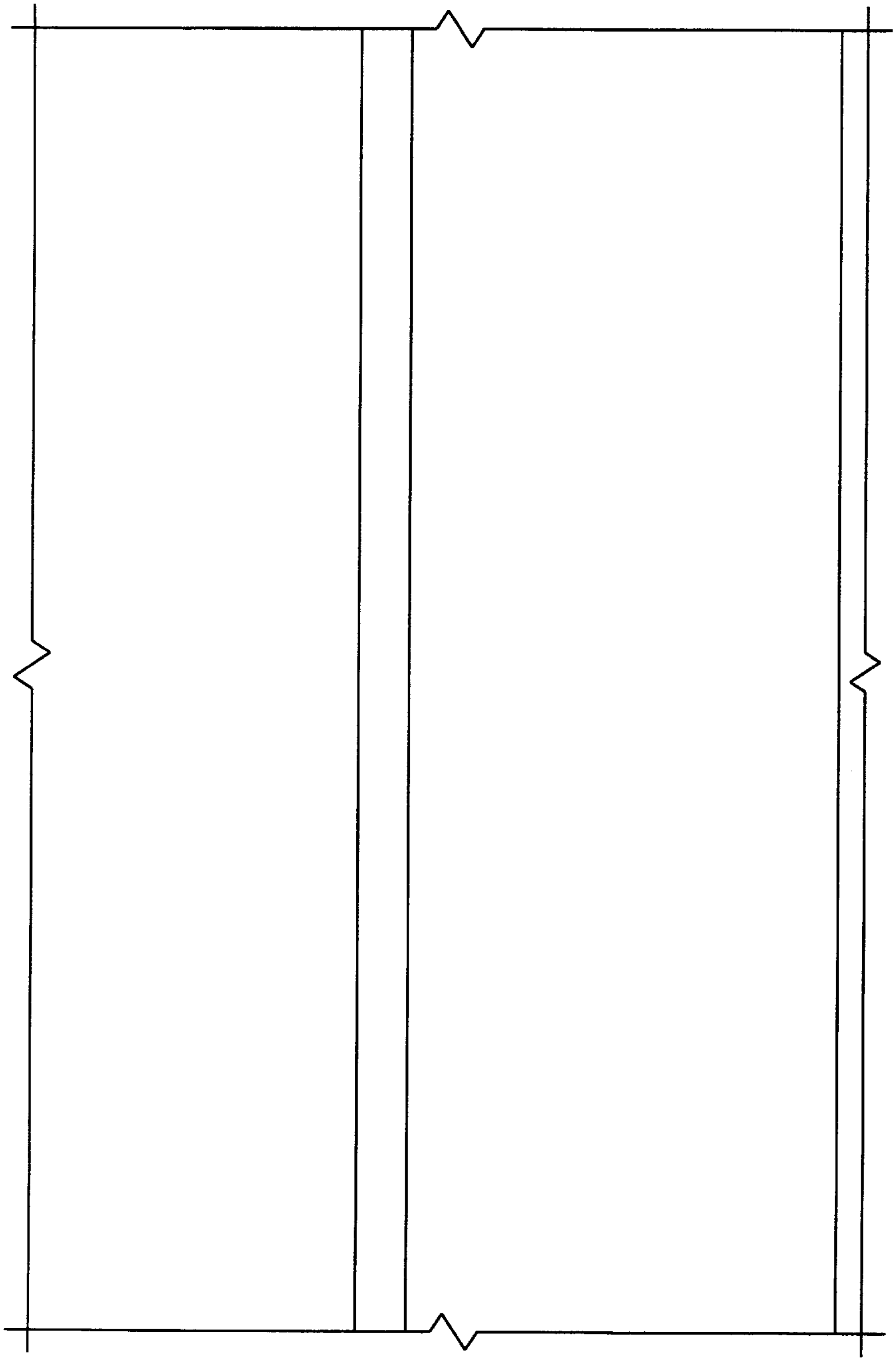
Figure 7F:
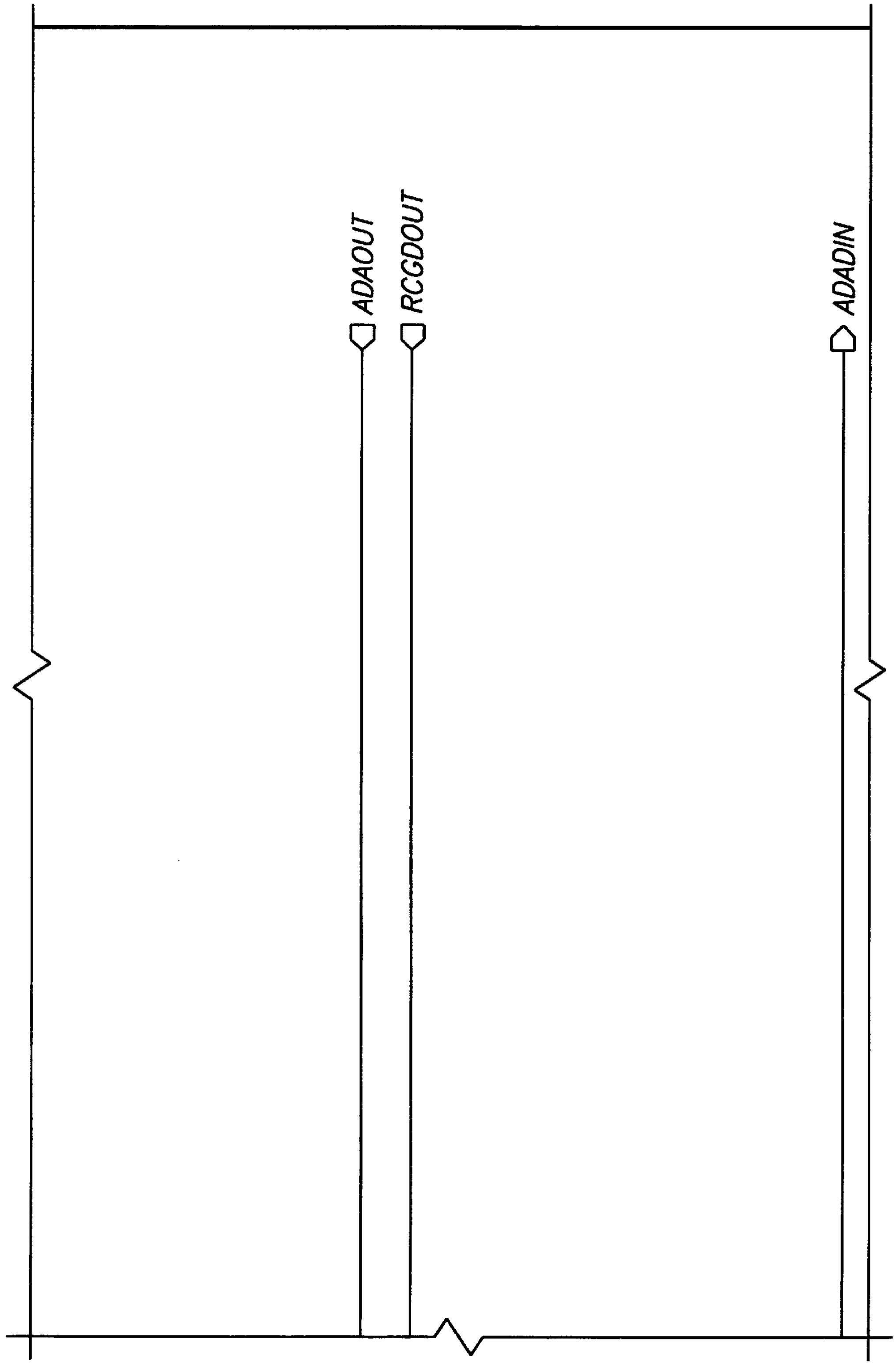
Figure 7G:
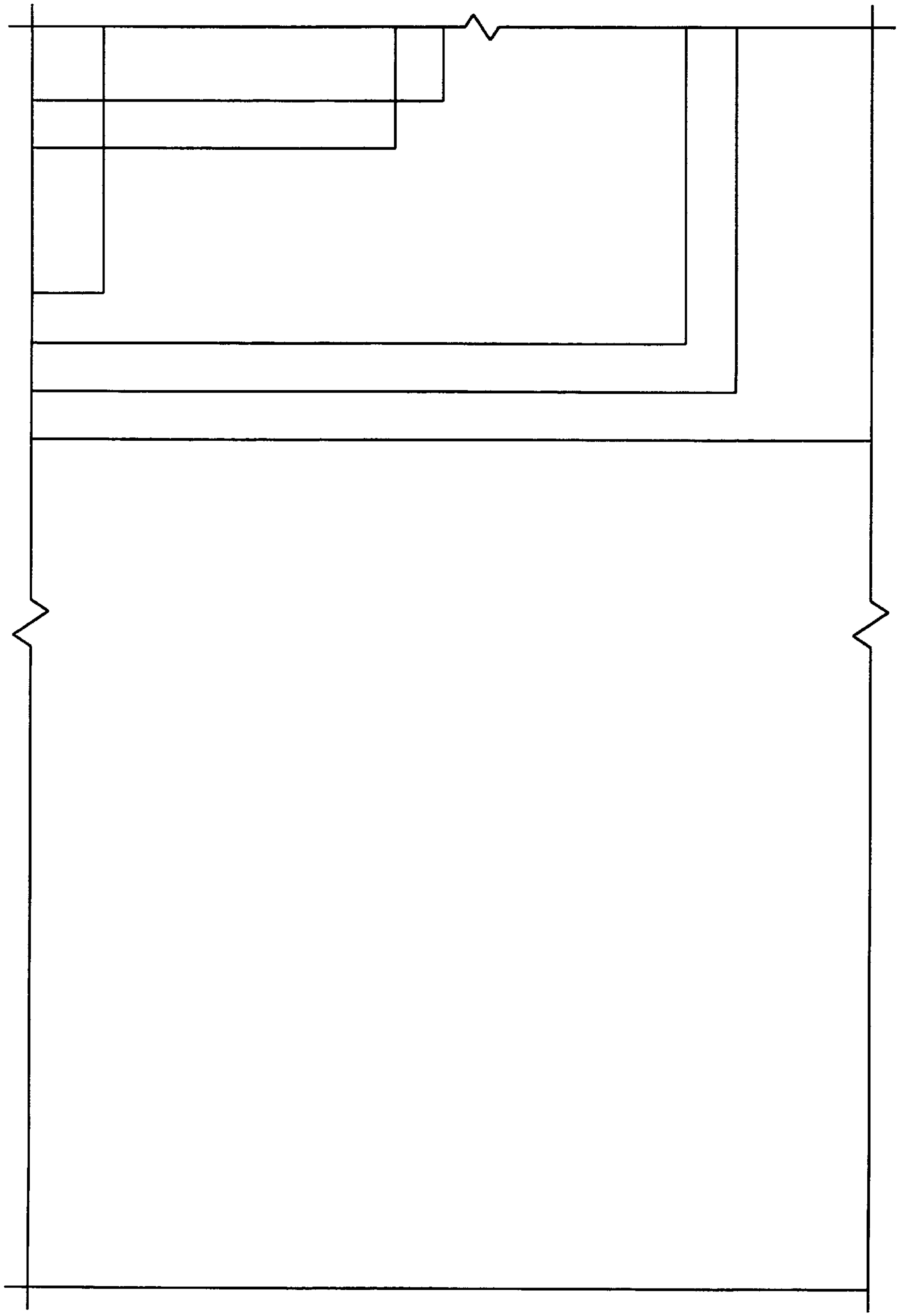
Figure 7G:
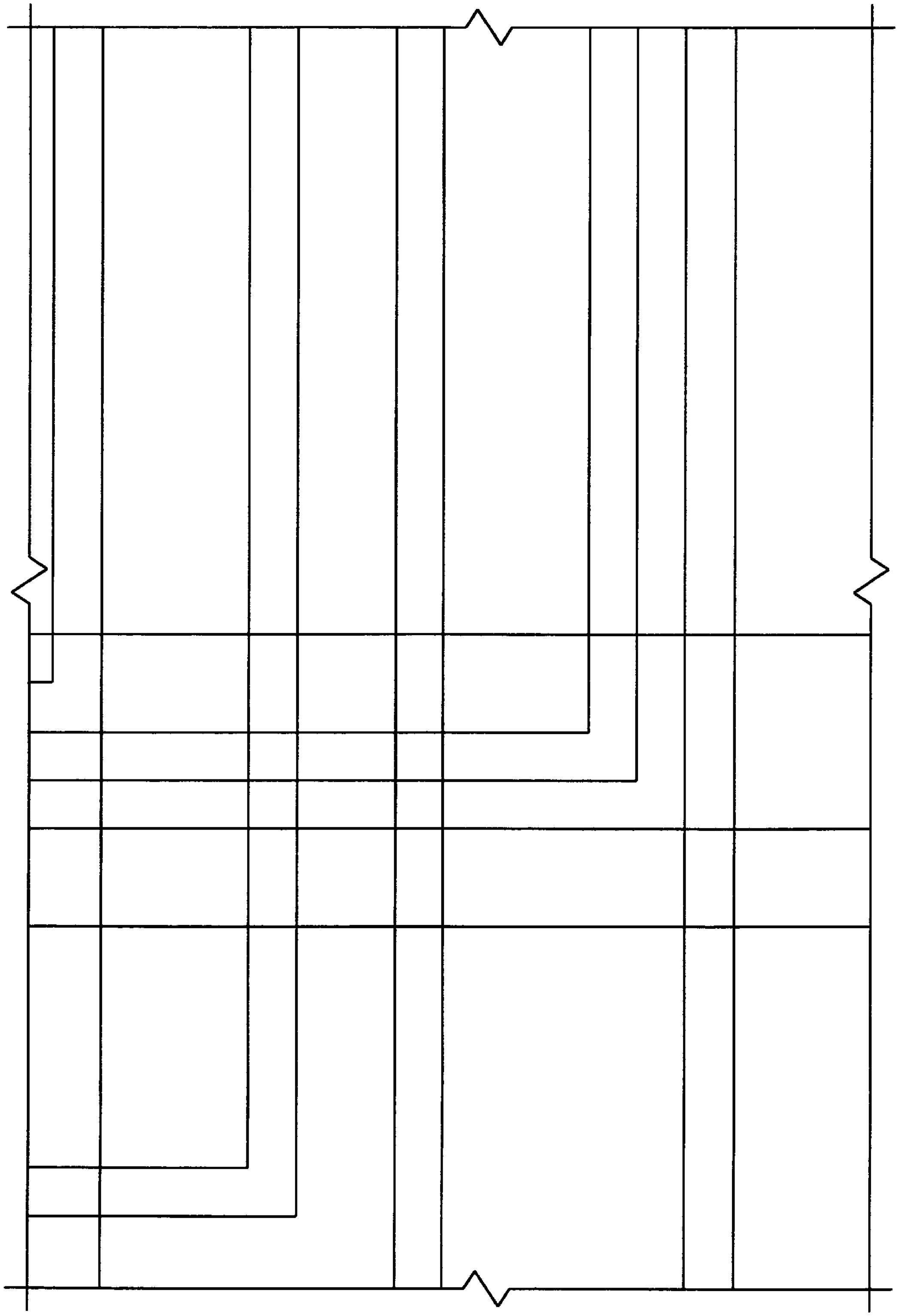
Figure 7G:
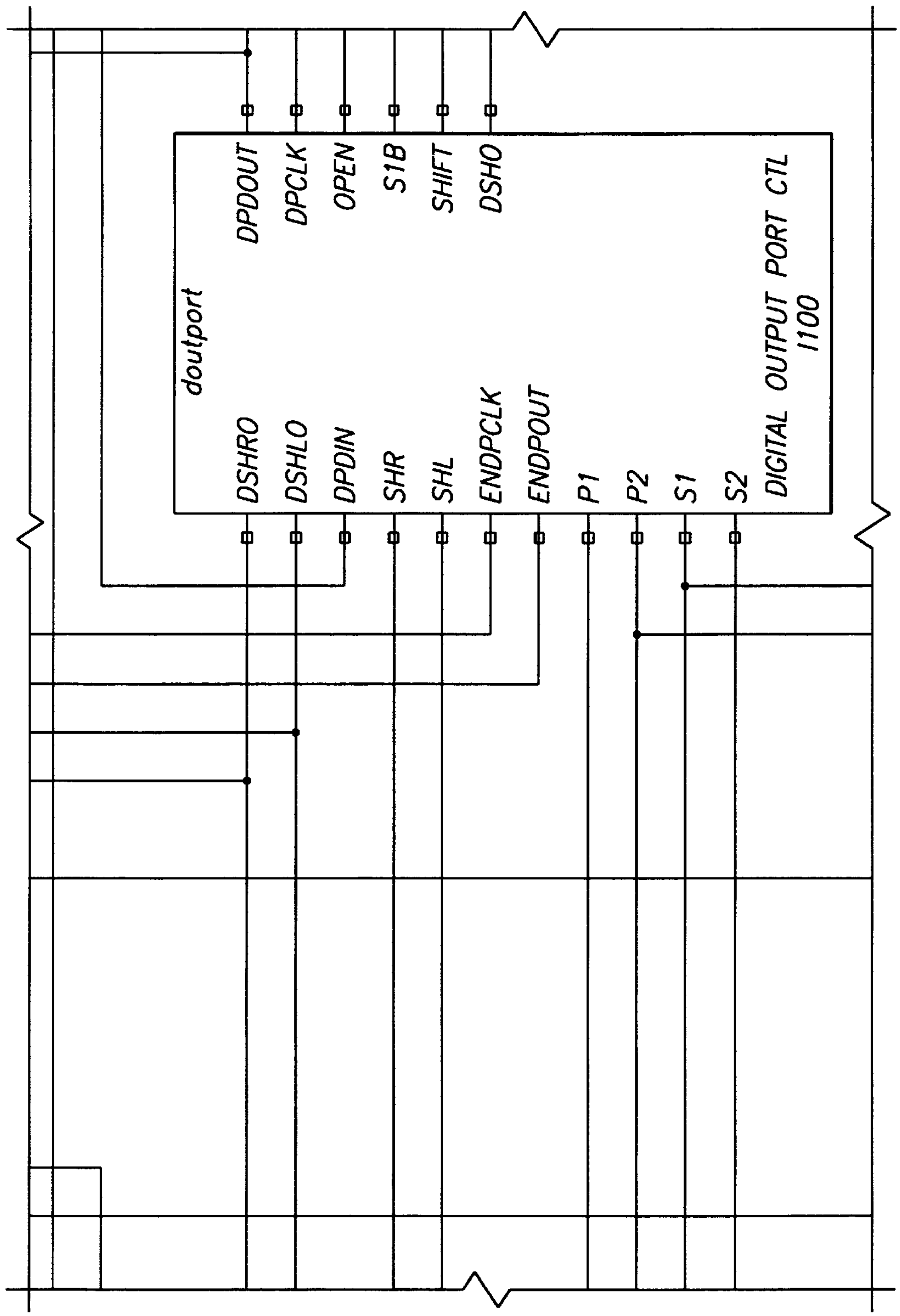
Figure 76G:
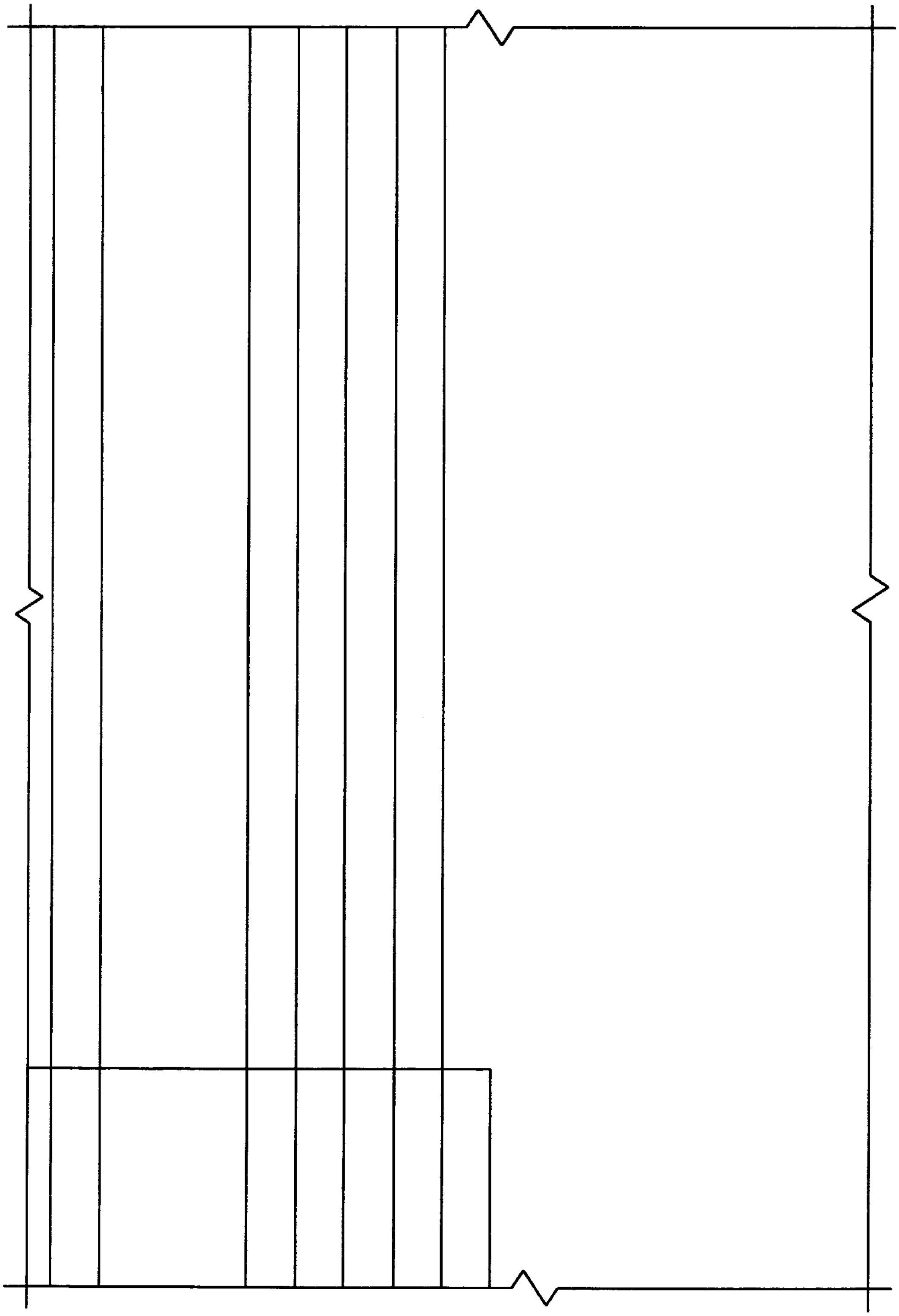
Figure 16H:
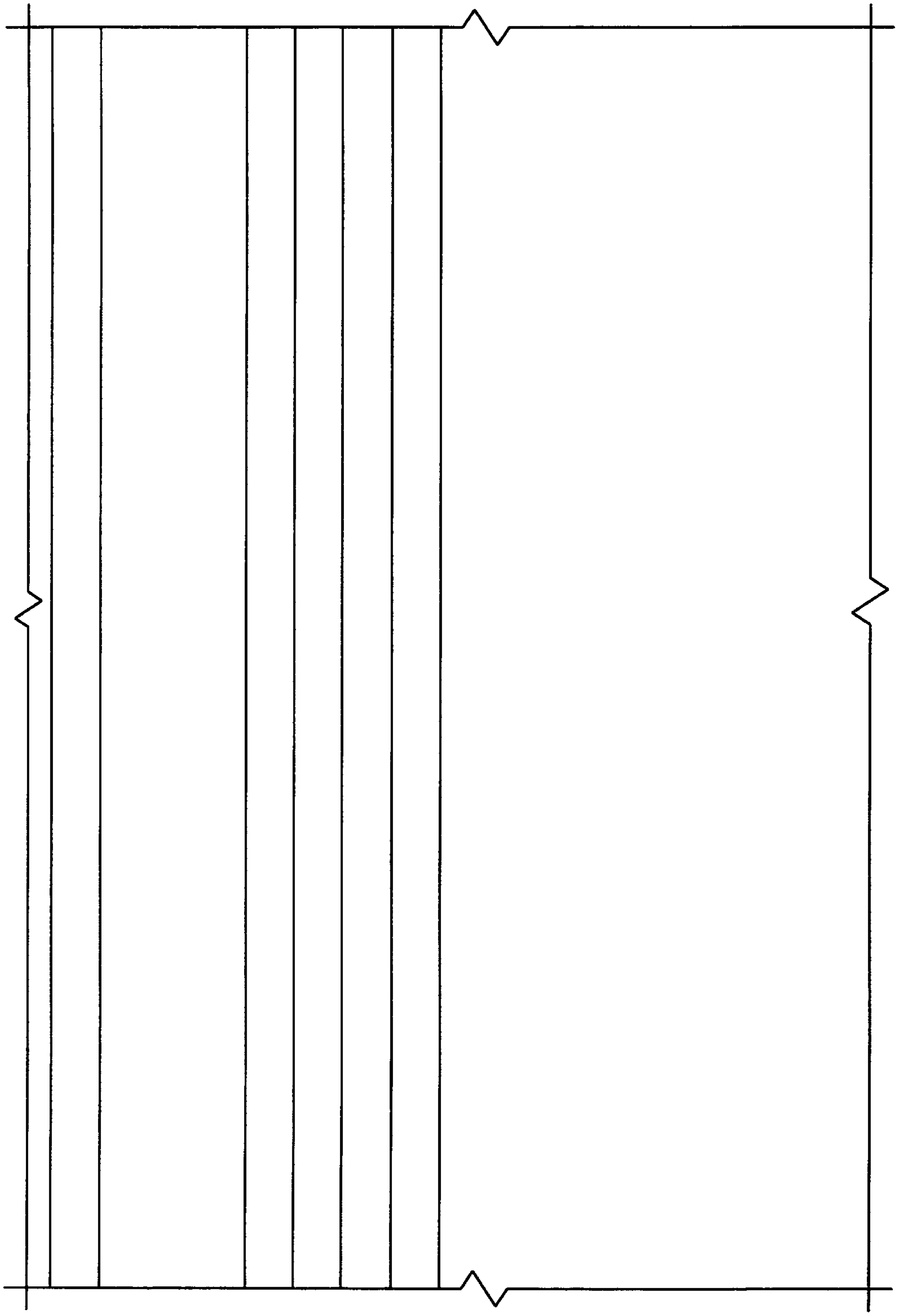
Figure 74B:
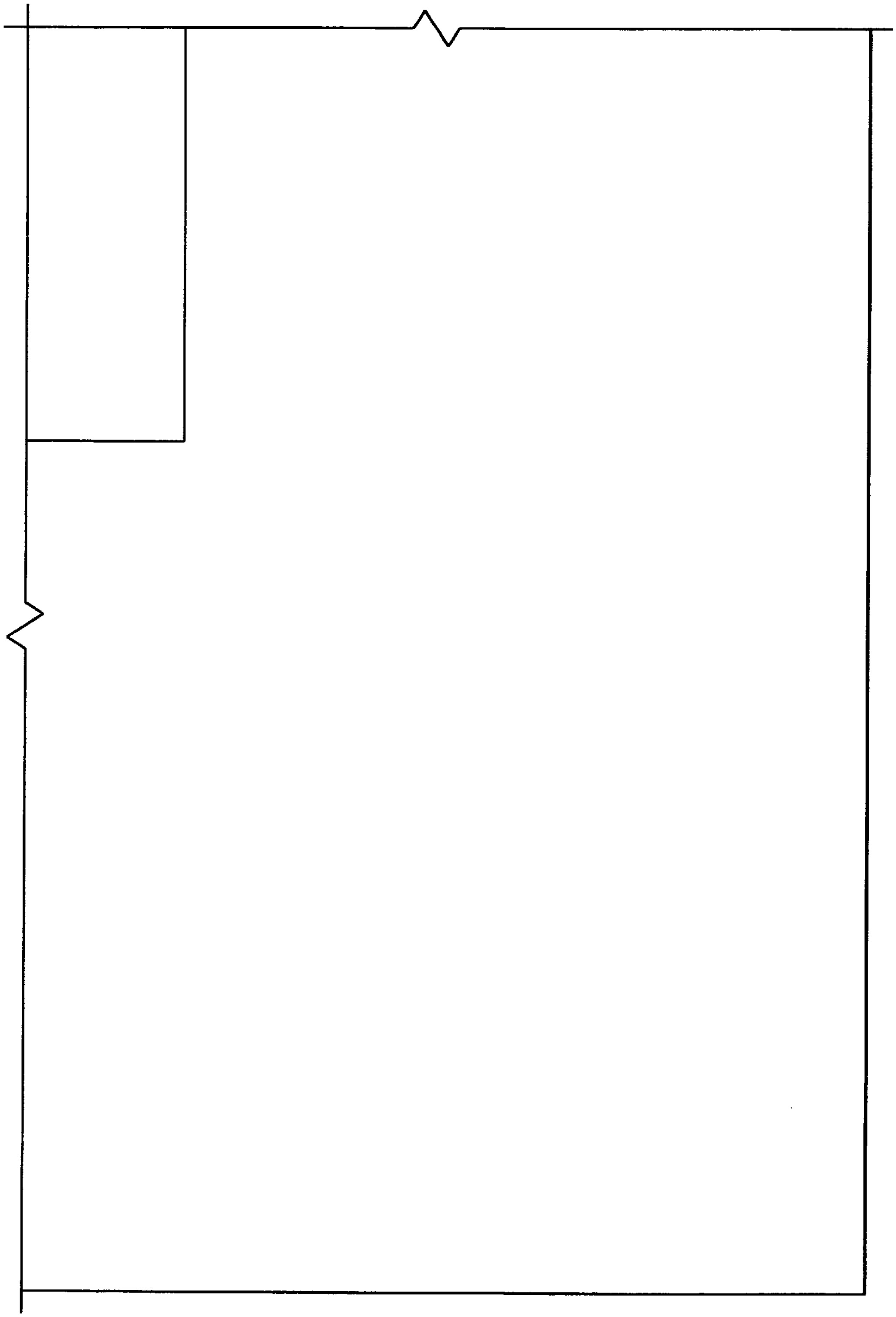
Figure 7H:
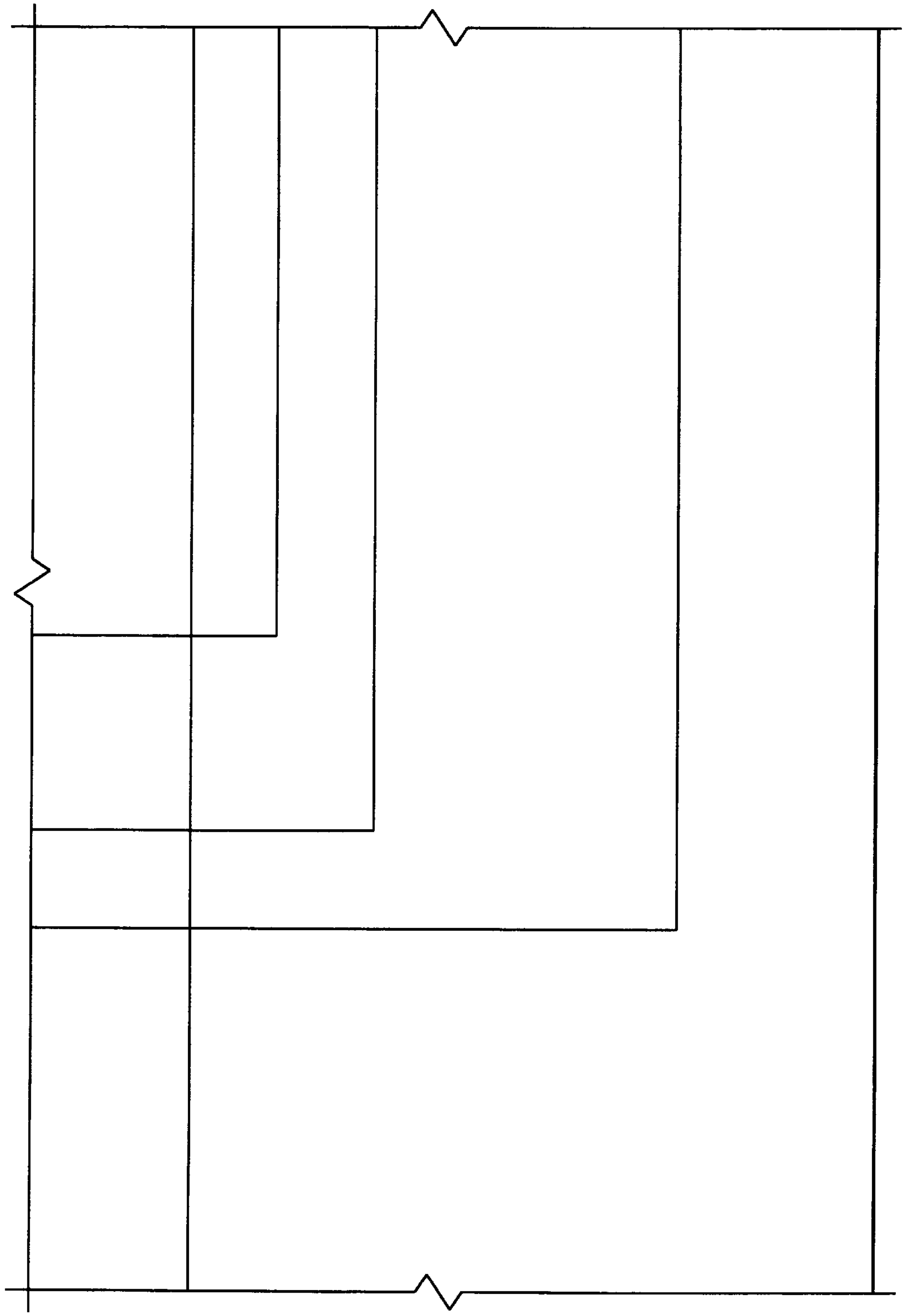
Figure 7H:
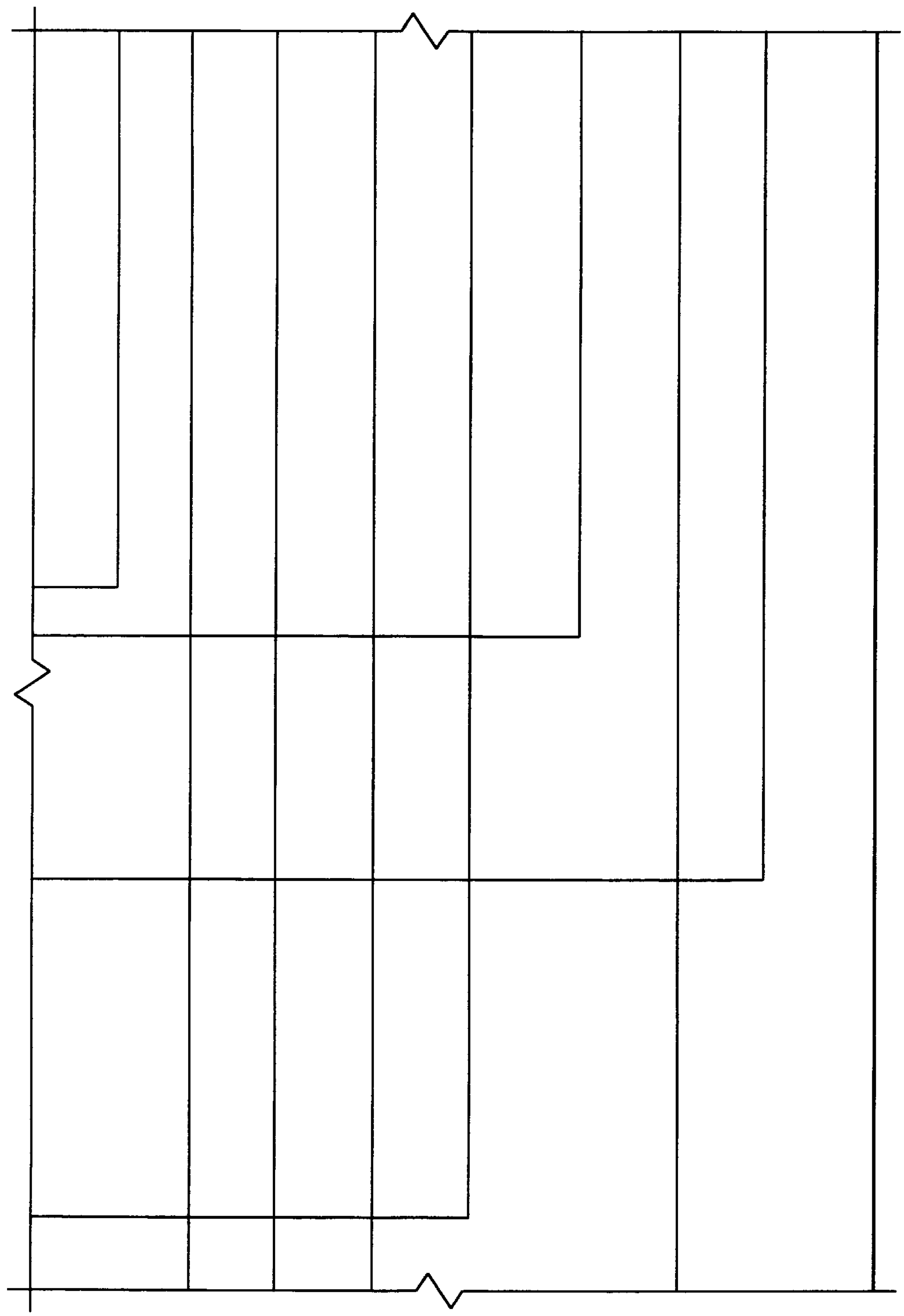
Figure 7H:
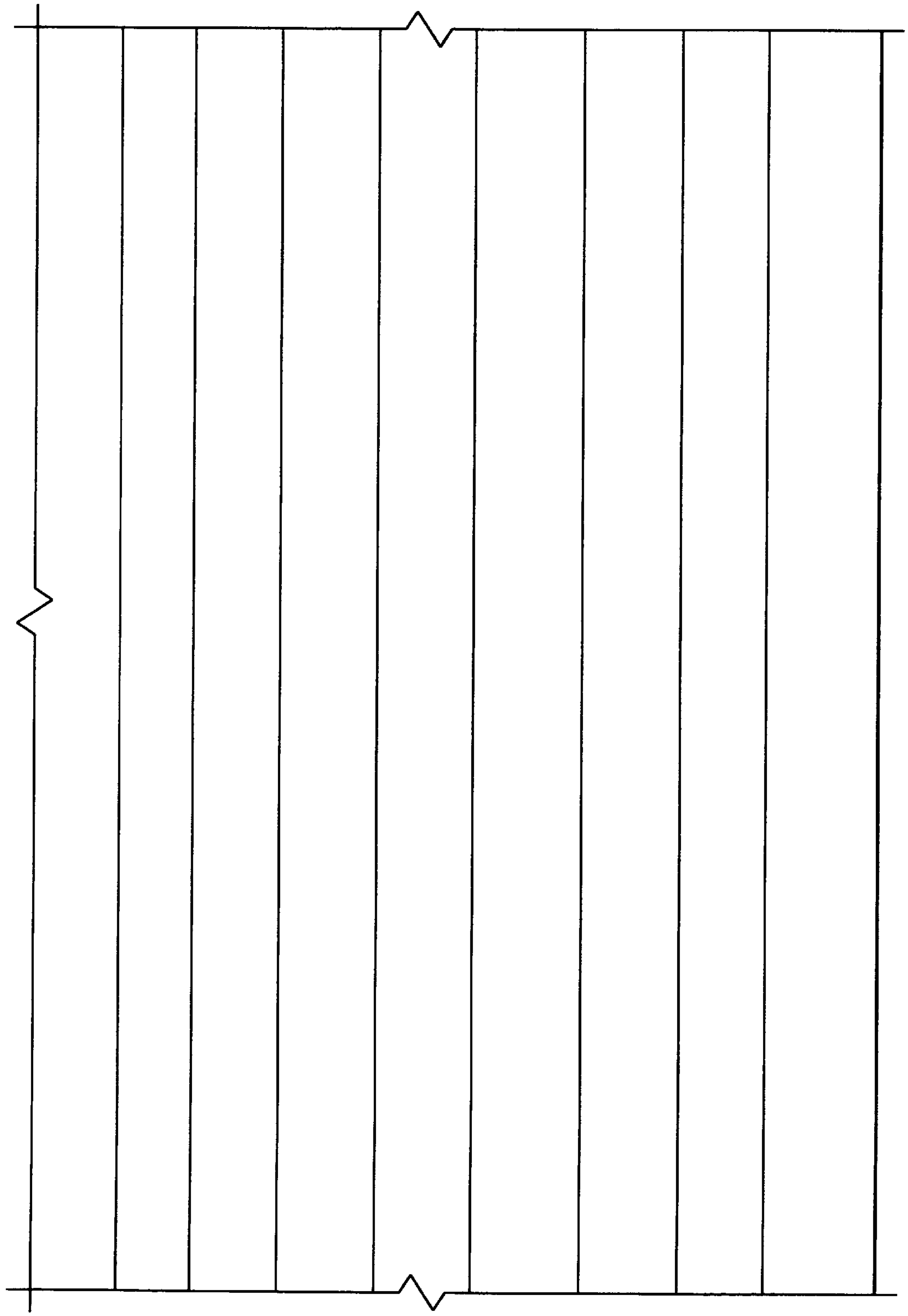
Figure 11H:
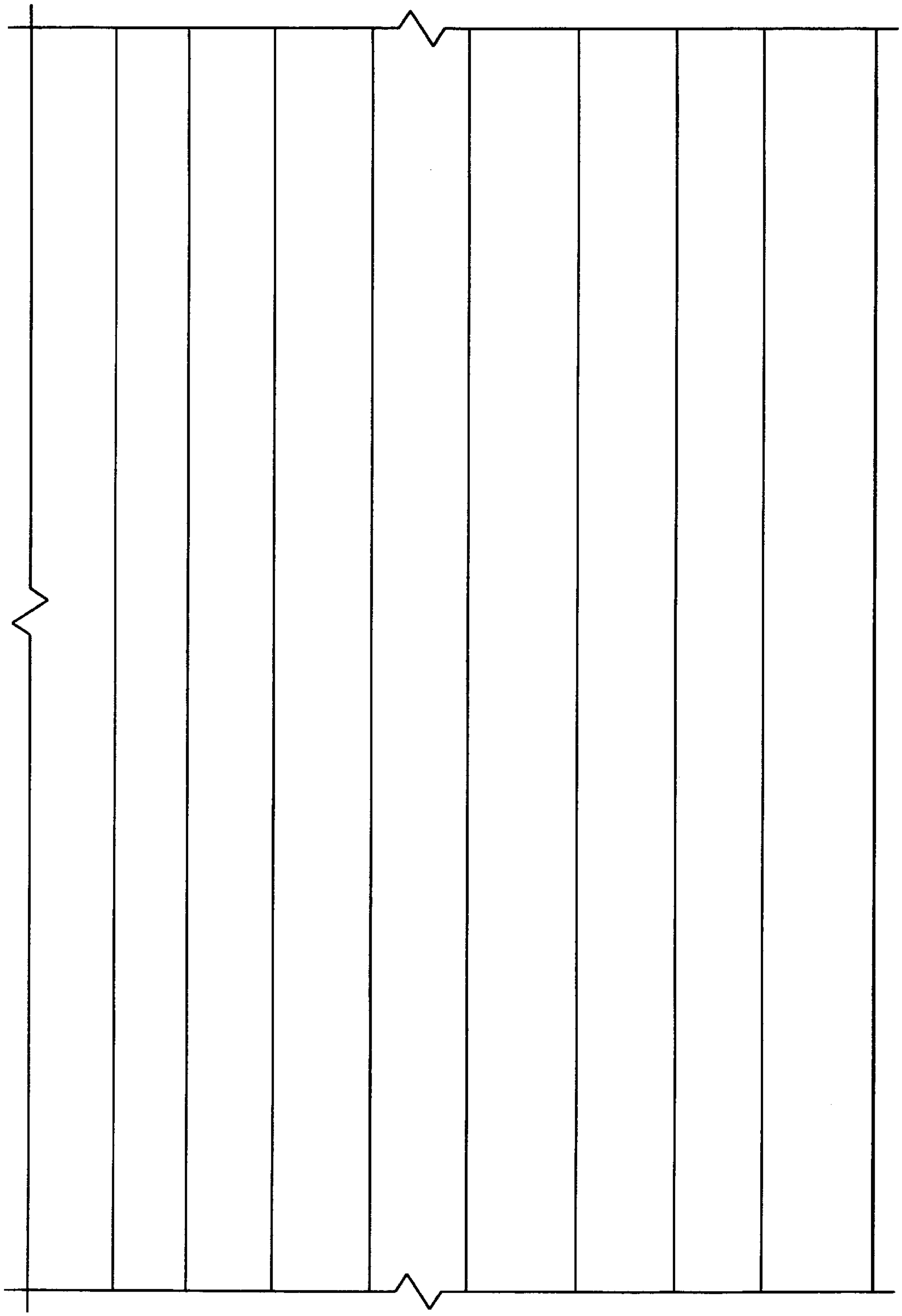
Figure 701:
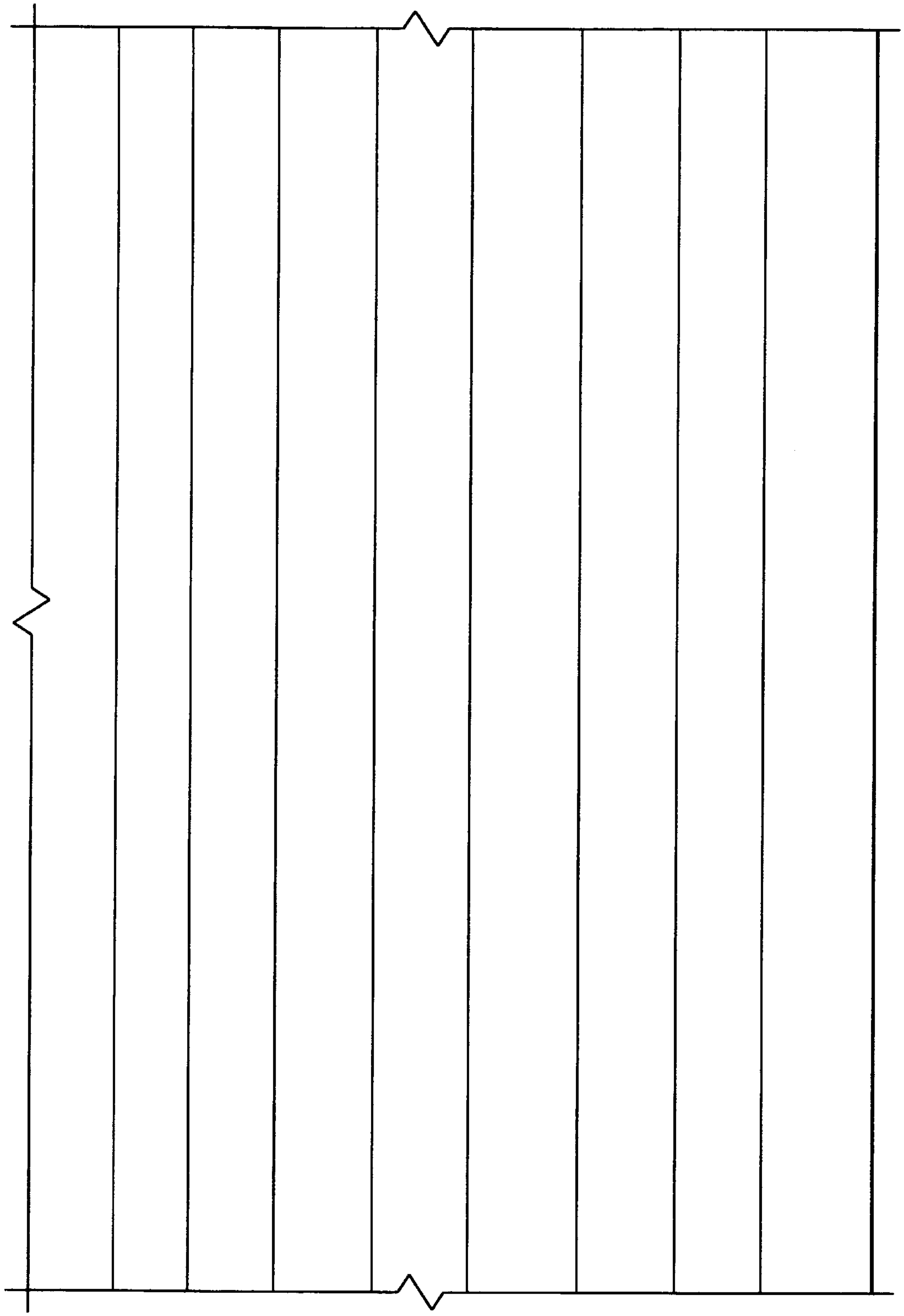
Figure 7H:
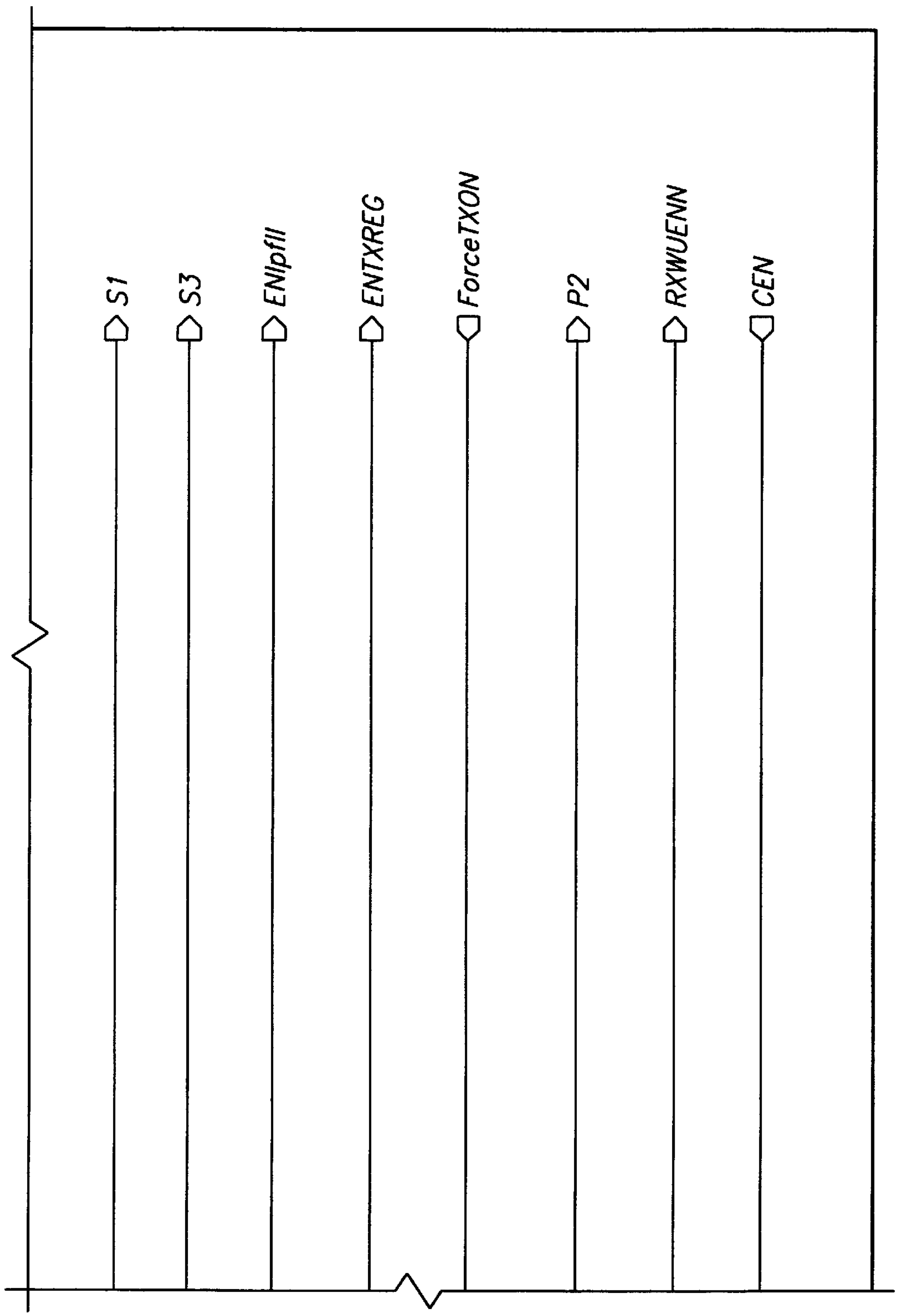
Figure 7D:
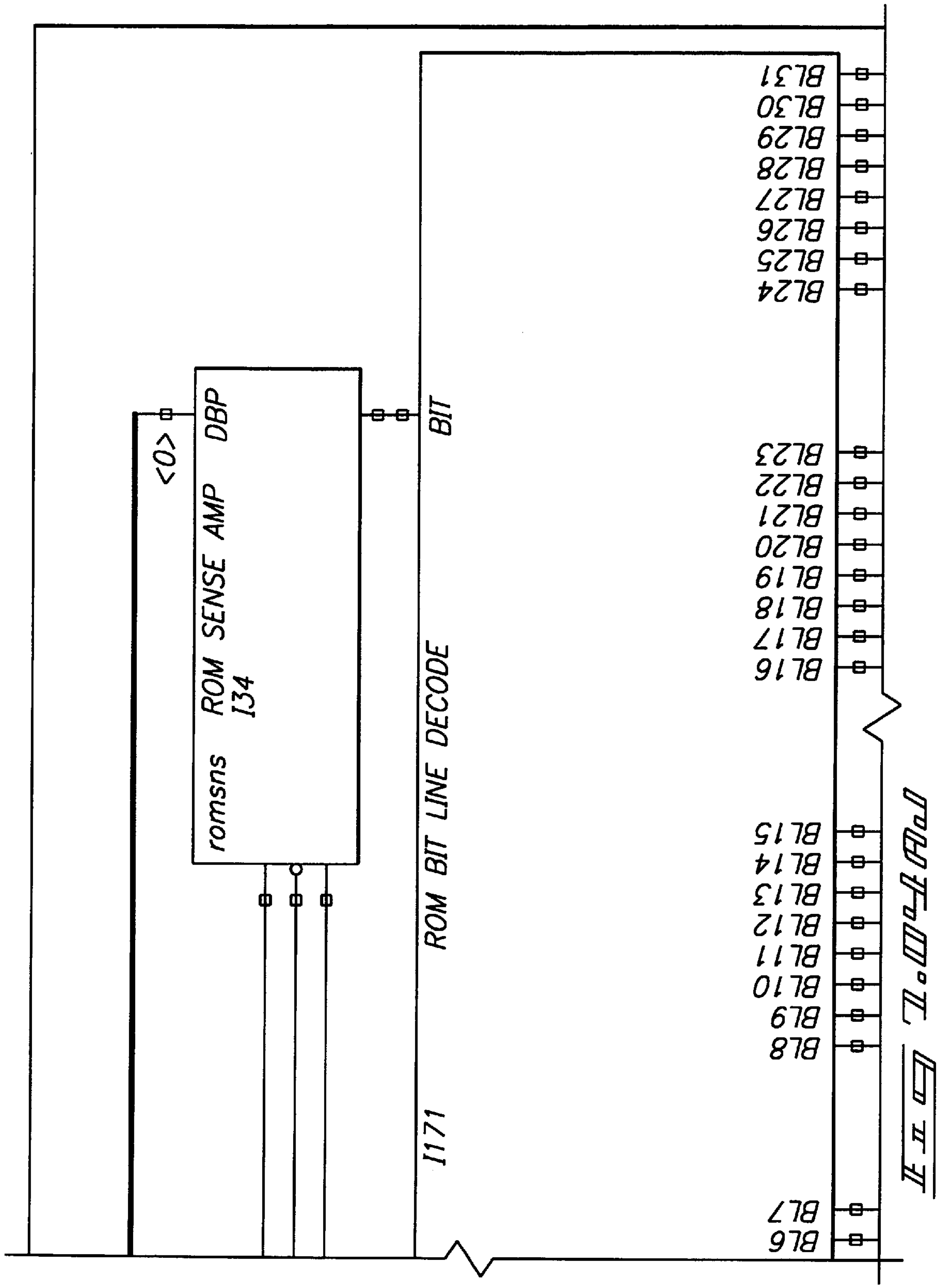
Figure 7L:
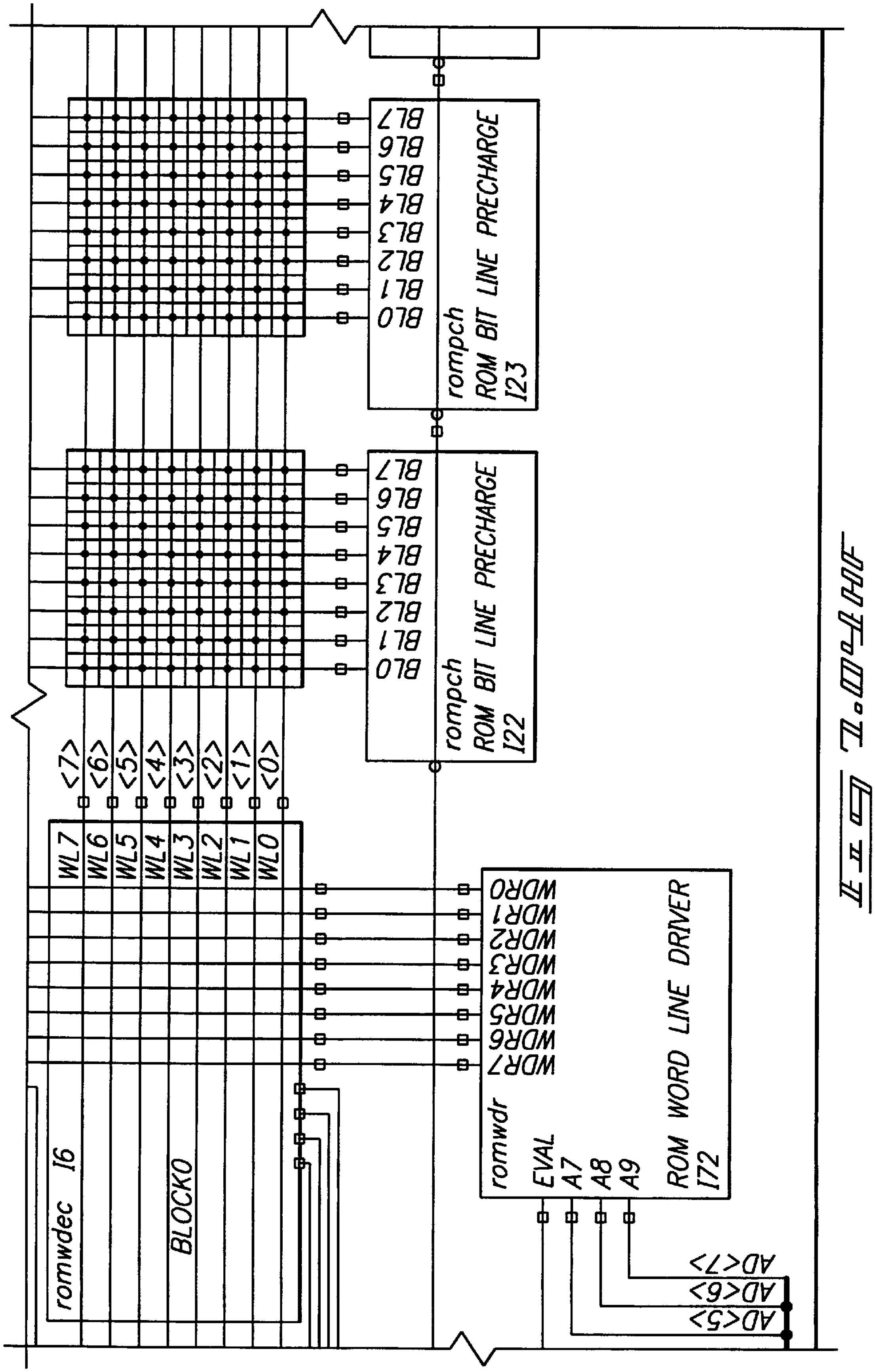
Figure 7L:
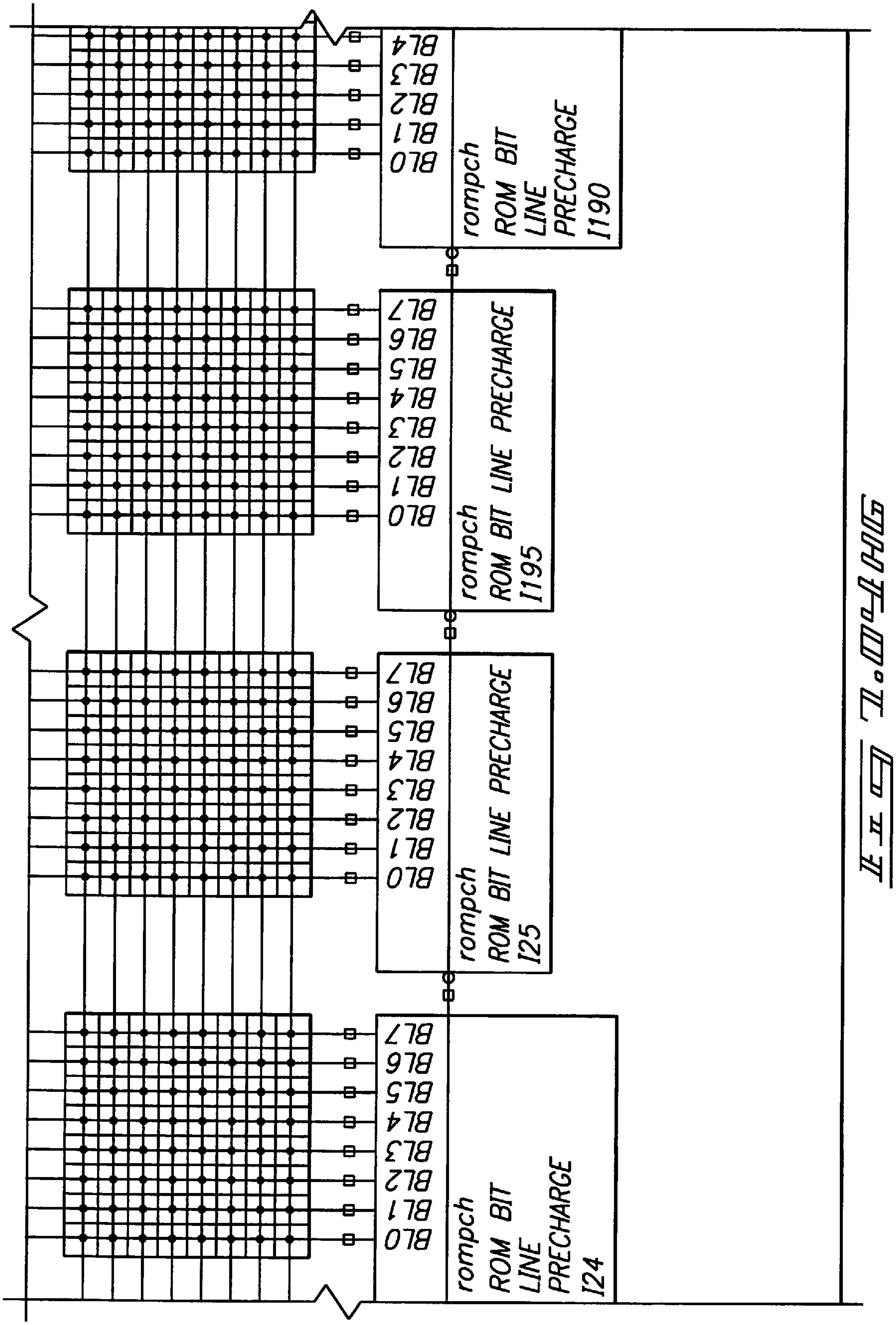

FIG. 72 is a table illustrating step sizes produced by the start-up circuit and the state machine.

SUMMARY OF THE INVENTION

The invention provides a radio frequency identification device comprising an integrated circuit including a receiver, a transmitter, and a microprocessor. The integrated circuit is preferably a monolithic single die integrated circuit including the receiver, the transmitter, and the microprocessor. Because the device includes an active transponder, instead of a transponder which relies on magnetic coupling for power, the device has a much greater range.

One aspect of the invention provides a radio frequency identification device comprising a monolithic integrated circuit including a receiver, a transmitter which can operate at frequencies above 400 MHz, and a microprocessor.

Another aspect of the invention provides a radio frequency identification device comprising a monolithic integrated circuit including a receiver, a transmitter which can operate at frequencies above 1 GHz, and a microprocessor.

Another aspect of the invention provides a radio frequency identification device comprising a monolithic integrated circuit including a transmitter, a microprocessor, and a receiver which can receive and interpret signals having frequencies above 400 MHz.

Another aspect of the invention provides a radio frequency identification device comprising a monolithic integrated circuit including a transmitter, a microprocessor, and a receiver which can receive and interpret signals having frequencies above 1 Ghz.

Another aspect of the invention provides a radio frequency identification device comprising a monolithic integrated circuit including a receiver, a microwave transmitter, and a microprocessor.

Another aspect of the invention provides a radio frequency identification device comprising a monolithic integrated circuit including a microwave receiver, a transmitter, and a microprocessor.

Another aspect of the invention provides a radio frequency identification device comprising a single die including a receiver, a transmitter, and a microprocessor, the die having a size less than 90,000 $mils^2$. In accordance with a more preferred embodiment of the invention, the die has a size less than 300×300 $mils^2$. In accordance with a more preferred embodiment of the invention, the die has a size less than 37,500 $mils^2$. In accordance with a more preferred embodiment of the invention, the die has a size of 209 by 116 $mils^2$.

Another aspect of the invention provides a radio frequency identification device comprising a single die integrated circuit including a receiver, a transmitter, and a microprocessor.

Another aspect of the invention provides a radio frequency identification device comprising a single die with a single metal layer including a receiver, a transmitter, and a microprocessor.

Another aspect of the invention provides a radio frequency identification device comprising a single die integrated circuit including a receiver, a transmitter, and a microprocessor formed using a single metal layer processing method.

Another aspect of the invention provides a radio frequency identification system comprising an integrated circuit including a receiver, and a transmitter; and an antenna coupled to the integrated circuit, the integrated circuit being responsive to radio frequency signals of multiple carrier frequencies.

Another aspect of the invention provides a radio frequency identification device comprising transponder circuitry formed in a monolithic integrated circuit comprising both transmitting and receiving circuits of the transponder circuitry; a power supply operably associated with the transponder circuitry; and an antenna operably associated with the transponder circuitry.

Another aspect of the invention provides a radio frequency identification device comprising a monolithic semiconductor integrated circuit including a receiver and a transmitter; means for applying a supply of power to the integrated circuit device from a battery; and means for configuring the integrated circuit to receive and transmit radio frequency signals.

Another aspect of the invention provides a method for producing a radio frequency identification device, the method comprising the following steps: providing a monolithic integrated circuit having a receiver and a transmitter; and providing a package configured to carry the integrated circuit.

Another aspect of the invention provides a method for adapting a radio frequency data communication device for use at a desired carrier frequency for use in a radio frequency identification (RFID) device, the method comprising the following steps: providing an integrated circuit having tunable circuitry, the integrated circuit comprising a receiver and a transmitter; configuring the integrated circuit for connection with a power supply to enable operation; configuring the integrated circuit to receive and apply radio frequency signals via an antenna, the antenna and the tunable circuitry cooperating in operation there between; and tuning the tunable circuitry and the antenna to realize a desired carrier frequency from a wide range of possible carrier frequencies. A method for adapting a radio frequency data communication device for use at a desired carrier frequency for use in a radio frequency identification device, the method comprising the following steps: providing an integrated circuit having tunable circuitry, the integrated circuit comprising a receiver and a transmitter; configuring the integrated circuit for connection with a power supply to enable operation; configuring the integrated circuit to receive and apply radio frequency signals via an antenna, the antenna and the tunable circuitry cooperating in operation there between; and tuning the antenna to realize a desired carrier frequency from a wide range of possible carrier frequencies.

Another aspect of the invention provides a radio frequency communications device comprising an integrated circuit including a transmitter and a receiver, the integrated circuit including a clock recovery circuit recovering a clock frequency from a signal received by the receiver, the clock recovery circuit having a phase lock loop including a voltage controlled oscillator, and a loop filter having a capacitor storing a voltage indicative of a frequency at which the voltage controlled oscillator is oscillating, the integrated circuit using the voltage stored on the capacitor to generate a clock frequency for the transmitter.

Another aspect of the invention provides a method of recovering a clock frequency from a received radio frequency signal, storing the clock frequency, and using the clock frequency for radio frequency transmission by a transmitter, the method comprising: providing a clock recovery circuit recovering a clock frequency from a signal received by the receiver, the clock recovery circuit having a phase lock loop including a voltage controlled oscillator, and a loop filter having a capacitor; using the clock recovery circuit to recover a clock frequency from a received radio frequency signal; storing on the capacitor a voltage indicative of frequency at which the voltage controlled oscillator is oscillating; using the voltage stored on the capacitor to generate a clock frequency for use by the transmitter.

Another aspect of the invention provides a method of recovering and storing a clock frequency from a received radio frequency signal in a radio frequency identification device including a transmitter and a receiver, the method comprising providing a clock recovery circuit recovering a clock frequency from a signal received by the receiver, the clock recovery circuit having a phase lock loop; using the clock recovery circuit to recover a clock frequency from a received radio frequency signal; storing in analog form a value indicative of frequency at which the voltage controlled oscillator is oscillating; and using the analog value to generate a clock frequency for use by the transmitter.

Another aspect of the invention provides a radio frequency communications device comprising an integrated circuit including a transmitter and a receiver, the transmitter being switchable between a backscatter mode, wherein a carrier for the transmitter is derived from a carrier received from an interrogator spaced apart from the radio frequency communications device, and an active mode, wherein a carrier for the transmitter is generated by the integrated circuit itself.

Another aspect of the invention provides a radio frequency communications device comprising an integrated circuit including a transmitter and a receiver, the transmitter selectively transmitting a signal using a modulation scheme, the transmitter being switchable for transmission using different modulation schemes.

Another aspect of the invention provides a method for adapting modulation schemes of a radio frequency data communication device in a radio frequency identification device, the method comprising the following steps: providing an integrated circuit having switching circuitry, a receiver, a transmitter, and a processor; the integrated circuit having a plurality of transmitting circuits including a first transmitting circuit configured to realize an active transmitter scheme and a second transmitting circuit configured to realize a modulated backscatter scheme; configuring the integrated circuit for connection with a power supply to enable operation; configuring the integrated circuit to receive and apply radio frequency signals via an antenna, the antenna and the tunable circuitry cooperating in operation; and switching the switchable circuitry with respect to the antenna to enable one of the transmitting circuits to realize one of the modulation schemes.

Another aspect of the invention provides a method for adapting modulation schemes of a radio frequency data communication device in a radio frequency identification device, the method comprising the following steps: providing an integrated circuit having switching circuitry, a receiver, a transmitter, and a processor, the integrated circuit including a plurality of transmitting circuits, the plurality of transmitting circuits configured to selectively realize a plurality of modulated backscatter schemes; configuring the integrated circuit for connection with a power supply to enable operation; configuring the integrated circuit to receive and apply radio frequency signals via an antenna, the antenna and the tunable circuitry cooperating in operation; and switching the transmitting circuits with respect to the antenna to enable one of the transmitting circuits to realize one of the modulation schemes.

Another aspect of the invention provides a radio frequency identification device comprising: an integrated circuit including a transmitter and a receiver, the integrated circuit being adapted to be connected to a battery, and further including a comparator comparing the voltage of the battery with a predetermined voltage and generating a low battery signal if the voltage of the battery is less than the predetermined voltage.

Another aspect of the invention provides a method for detecting a low battery condition in a radio frequency data communication device for use in a radio frequency identification device, the method comprising the following steps: providing an integrated circuit having switching circuitry, a receiver, and a transmitter, the integrated circuit including a comparator configured to compare the battery voltage with a predetermined voltage and generate a low battery signal if the battery voltage is less than the predetermined voltage; configuring the integrated circuit for connection with the battery to enable operation; configuring the integrated circuit to receive and apply radio frequency signals via an antenna, the antenna and the tunable circuitry cooperating in operation there between; determining a predetermined voltage for the battery; comparing the voltage of the battery with the predetermined voltage; and generating a low battery signal if the voltage of the battery is less than the predetermined voltage.

Another aspect of the invention provides a radio frequency communications device comprising an integrated circuit including a transmitter and a receiver, the integrated circuit periodically checking if a radio frequency signal is being received by the receiver, the integrated circuit further including a timer setting a time period for the checking, the timer having a frequency lock loop.

Another aspect of the invention provides a radio frequency communications device comprising an integrated circuit including a transmitter and a receiver, the integrated circuit being configured to periodically check if a radio frequency signal is being received by the receiver, the integrated circuit further including a timer setting a time period for the checking, the timer having a phase lock loop.

Another aspect of the invention provides a method for calibrating a clock in a radio frequency data communication device for use in a radio frequency identification device, the method comprising the following steps: providing an integrated circuit having a receiver and a transmitter, the integrated circuit including a timer having a frequency lock loop configured to set a time period for periodically checking if a radio frequency signal is being received by the receiver; configuring the integrated circuit for connection with a battery to enable operation; configuring the integrated circuit to receive and apply radio frequency signals via an antenna, the antenna and the integrated circuit cooperating in operation therebetween; and periodically checking whether a radio frequency signal is being received by the receiver.

Another aspect of the invention provides a radio frequency identification device for receiving and responding to radio frequency commands from an interrogator transmitting a radio frequency signal, the device comprising an integrated circuit including a receiver, a transmitter, and a connection pin, the integrated circuit being switchable between a radio frequency receive mode wherein the receiver receives commands via radio frequency, and a direct receive mode wherein commands are received via the connection pin.

Another aspect of the invention provides a radio frequency identification device for receiving and responding to radio frequency commands from an interrogator transmitting a radio frequency signal, the device comprising an integrated circuit including a receiver, a transmitter, and a digital input pin, the integrated circuit being switchable between a radio frequency receive mode wherein the receiver receives commands via radio frequency, and a direct receive mode wherein commands are received digitally via the digital input pin. Another aspect of the invention provides a radio frequency identification device for receiving and responding to radio frequency commands from an interrogator transmitting a radio frequency signal, the device comprising an integrated circuit including a receiver, a transmitter, and a connection pin, the integrated circuit being switchable between a radio frequency receive mode wherein the receiver receives commands via radio frequency, and a direct receive mode wherein a modulation signal without a carrier is received via the connection pin.

Another aspect of the invention provides a radio frequency identification device for receiving and responding to radio frequency commands from an interrogator transmitting a radio frequency signal, the device comprising an integrated circuit including a receiver, a transmitter, and a connection pin, the integrated circuit being switchable between a radio frequency transmit mode wherein the receiver transmits responses to the commands via radio frequency, and a direct transmit mode wherein responses are transmitted via the connection pin.

Another aspect of the invention provides a radio frequency identification device for receiving and responding to radio frequency commands from an interrogator transmitting a radio frequency signal, the device comprising an integrated circuit including a receiver, a transmitter, and a digital output pin, the integrated circuit being switchable between a radio frequency transmit mode wherein the receiver transmits responses to the commands via radio frequency, and a direct transmit mode wherein responses are transmitted digitally via the digital output pin.

Another aspect of the invention provides a radio frequency identification device for receiving and responding to radio frequency commands from an interrogator transmitting a radio frequency signal, the device comprising an integrated circuit including a receiver, a transmitter, and a connection pin, the integrated circuit being switchable between a radio frequency transmit mode wherein the receiver transmits responses to the commands via radio frequency, and a direct transmit mode wherein a modulation signal without a carrier is transmitted via the connection pin.

Another aspect of the invention provides a method comprising the following steps: providing an integrated circuit having a receiver, a transmitter, and a connection pin, the integrated circuit including a switchable circuit configured to switch between a radio frequency receive mode wherein the receiver receives commands via radio frequency, and a direct receive mode wherein commands are received via the connection pin; configuring the integrated circuit for connection with a battery; configuring the integrated circuit to receive and transmit radio frequency signals via an antenna, the antenna and the integrated circuit cooperating in operation; and switching to one of the radio frequency receive mode and the direct receive mode to enable receipt of radio frequency commands or commands received via the connection pin. Another aspect of the invention provides a method comprising the following steps: providing an integrated circuit having a receiver, a transmitter, and a connection pin, the integrated circuit including a switchable circuit configured to switch between a radio frequency transmit mode wherein the transmitter transmits information via radio frequency, and a direct transmit mode wherein data is transmitted via the connection pin; configuring the integrated circuit for connection with a battery; configuring the integrated circuit to receive and transmit radio frequency signals via an antenna, the antenna and the integrated circuit cooperating in operation; and switching to one of the radio frequency transmit mode and the direct transmit mode to enable transmission of information via radio frequency or via the connection pin.

Another aspect of the invention provides an integrated circuit comprising a radio frequency receiver; a unique, non-alterable indicia identifying the integrated circuit; and a radio frequency transmitter configured to transmit a signal representative of the indicia in response to a command received by the receiver.

Another aspect of the invention provides a radio frequency identification device comprising an integrated circuit including a receiver for receiving radio frequency commands from an interrogation device, and a transmitter for transmitting a signal identifying the device to the interrogator, the transmitter and receiver being formed on a die having a lot number, wafer number, and die number, the integrated circuit including non-alterable indicia identifying the lot number, wafer number, and die number, the transmitter being configured to transmit the non-alterable indicia in response to a manufacturer's command received by the receiver, the transmitted non-alterable indicia being different from the identifying signal.

Another aspect of the invention provides a method of tracing manufacturing process problems by tracing the origin of a defective radio frequency identification integrated circuit, the method comprising: forming a non-alterable indicia on a die for the integrated circuit, the indicia representing the wafer lot number, wafer number, and die number on the wafer, the indicia being not readily ascertainable by a user; and causing the integrated circuit to transmit the non-alterable indicia via radio frequency in response to a manufacturer's command.

Another aspect of the invention provides a method of tracing stolen property including a radio frequency identification integrated circuit, the method comprising: forming a non-alterable indicia on a die for the integrated circuit, the indicia representing the wafer lot number, wafer number, and die number on the wafer, the indicia being not readily ascertainable by a user; and causing the integrated circuit to transmit the non-alterable indicia via radio frequency in response to a manufacturer's command.

Another aspect of the invention provides a method of tracing manufacturing process problems in the manufacture of a radio frequency integrated circuit by tracing defect origin, the method comprising the following steps: providing a detectable signature on the integrated circuit, the signature indicative of one or more of the wafer lot number, wafer number, and die number of a die for the integrated circuit; and enabling the integrated circuit to transmit the signature via radio frequency responsive to an inquiry command.

Another aspect of the invention provides a radio frequency identification device comprising: an integrated circuit including a microprocessor, a receiver receiving radio frequency commands from an interrogation device, and a transmitter transmitting a signal identifying the device to the interrogator, the integrated circuit switching between a sleep mode, and a microprocessor on mode, in which more power is consumed than in the sleep mode, if the microprocessor determines that a signal received by the receiver is a radio frequency command from an interrogation device.

Another aspect of the invention provides a method for conserving power during operation of a radio frequency identification device, the method comprising the following steps: providing a receiver, a transmitter, microprocessor, and wake-up circuitry, the wake-up circuitry configured to selectively supply clock signals to the processor and thus control power consumption of the processor; configuring the receiver with an antenna to receive radio frequency signals from an interrogation device; configuring the transmitter to transmit a signal identifying the device to the interrogator; selectively enabling powered wake-up of the receiver to periodically check for presence of radio frequency signals; detecting whether a radio frequency signal is valid; and depending on whether a radio frequency signal is valid, supplying clock signals to the processor.

Another aspect of the invention provides a method for conserving power during operation of a radio frequency identification device, the method comprising the following steps: providing a receiver, a transmitter, microprocessor, and wake-up circuitry, the wake-up circuitry configured to selectively supply power to the processor; configuring the receiver with an antenna to receive radio frequency signals from an interrogation device; configuring the transmitter to transmit a signal identifying the device to the interrogator; selectively enabling powered wake-up of the receiver to periodically check for presence of radio frequency signals; detecting whether a radio frequency signal is valid; and depending on whether a radio frequency signal is valid, supplying power signals to the processor.

Another aspect of the invention provides a radio frequency identification device comprising an integrated circuit including a microprocessor, a transmitter, and a receiver, the integrated circuit being switchable between a sleep mode, and a microprocessor on mode in which more power is consumed than in the sleep mode, the integrated circuit being switched from the sleep mode to the microprocessor on mode in response to a direct sequence spread spectrum modulated radio frequency signal, which has a predetermined number of transitions within a certain period of time, being received by the receiver.

Another aspect of the invention provides a method for conserving power in a radio frequency identification device, the method comprising periodically switching from a sleep mode to a receiver on mode and performing the following tests to determine whether to further switch to a microprocessor on mode because a valid radio frequency signal is present: (a) determining if any radio frequency signal is present and, if so, proceeding to step (b); and, if not, returning to the sleep mode; and (b) determining if the radio frequency signal has a predetermined number of transitions per a predetermined time period of time and, if so, switching to the microprocessor on mode; and, if not, returning to the sleep mode.

Another aspect of the invention provides a radio frequency identification device switchable between a sleep mode and a mode in which more power is consumed than in the sleep mode, the radio frequency identification device comprising a transponder including a receiver and a transmitter; means for periodically checking whether any radio frequency signal is being received by the receiver; and means for determining if a radio frequency signal has a predetermined number of transitions within a predetermined period of time.

Another aspect of the invention provides a method for conserving power in a radio frequency identification device, the method comprising periodically switching from a sleep mode to a receiver on mode and performing the following tests to determine whether to further switch to a microprocessor on mode because a valid radio frequency signal is present: (a) determining if any radio frequency signal is present and, if so, proceeding to step (b); and, if not, returning to the sleep mode; (b) determining if the radio frequency signal is modulated and has a predetermined number of transitions per a predetermined period of time and, if so, proceeding to step (c); and, if not, returning to the sleep mode; and (c) determining if the modulated radio frequency signal has a predetermined number of transitions per a predetermined period of time different from the predetermined time of step (b) and, if so, switching to the microprocessor on mode; and, if not, returning to the sleep mode.

Another aspect of the invention provides a method of forming an integrated circuit including a Schottky diode, the method comprising: providing a p-type substrate; defining an n-type region relative to the substrate; forming an insulator over the n-type region; removing an area of the insulator for definition of a contact hole, and removing an area encircling the contact hole; forming n+regions in the n-type regions encircling the contact hole; depositing a Schottky metal in the contact hole; and annealing the metal to form a silicide interface to the n-type region.

Another aspect of the invention provides a method of forming an integrated circuit including a Schottky diode, the method comprising: providing a substrate; defining a p-type region relative to the substrate; forming an insulator over the p-type region; removing an area of the insulator for definition of a contact hole, and removing an area encircling the contact hole; forming p+regions in the p-type regions encircling the contact hole; depositing a Schottky metal in the contact hole; and annealing the Schottky metal to form a silicide interface to the p-type region.

Another aspect of the invention provides a method of forming an integrated circuit including a Schottky diode, the method comprising: providing a p-type substrate; defining an n-well region relative to the substrate; forming a BPSG insulator over the n-well region; etching away an area of the BPSG for definition of a contact hole, and etching an area encircling the contact hole; forming n+regions in the n-well regions encircling the contact hole; depositing titanium in the contact hole; and annealing the titanium to form a silicide interface to the n-well region.

Another aspect of the invention provides a method of forming an integrated circuit including a Schottky diode, the method comprising: providing an n-type substrate; defining a p-well region relative to the substrate; forming a BPSG insulator over the p-well region; etching away an area of the BPSG for definition of a contact hole, and etching an area encircling the contact hole; forming p+regions in the p-well regions encircling the contact hole; depositing titanium in the contact hole; and annealing the titanium to form a silicide interface to the p-well region.

Another aspect of the invention provides a radio frequency communications system comprising an antenna; an integrated circuit including a receiver having a Schottky diode detector including a Schottky diode coupled to the antenna; and a current source connected to drive current through the antenna and the Schottky diode.

Another aspect of the invention provides an integrated circuit for radio frequency communications comprising an inductorless radio frequency detector.

Another aspect of the invention provides a system comprising an antenna; a transponder including a receiver having a Schottky diode detector including a Schottky diode having a first terminal coupled to the antenna and having a second terminal; and means for driving current through both the antenna and the Schottky diode in a direction from the first terminal to the second terminal.

Another aspect of the invention provides a system comprising an antenna;

a transponder including a receiver having a Schottky diode detector including a Schottky diode having a first terminal coupled to the antenna and having a second terminal; and means for driving current through both the antenna and the Schottky diode in a direction from the second terminal to the first terminal. Another aspect of the invention provides a system comprising an antenna;

a transponder including a receiver having a Schottky diode detector including a Schottky diode having an anode coupled to the antenna and having a cathode; and means for driving current through both the antenna and the Schottky diode in a direction from the anode to the cathode.

Another aspect of the invention provides a radio frequency communications system comprising: an antenna; an integrated circuit including a receiver having a Schottky diode detector including a Schottky diode having an anode coupled to the antenna and having a cathode, the Schottky diode detector further including a capacitor connected between the cathode and ground, and including a capacitor having a first contact connected to the cathode and having a second contact defining an output of the Schottky diode detector; a current source connected to the cathode to drive current through the antenna and the Schottky diode in a direction from the anode to the cathode.

Another aspect of the invention provides a radio frequency communications system comprising an antenna; an integrated circuit including a receiver having a Schottky diode detector including a Schottky diode having a cathode coupled to the antenna and having an anode, the Schottky diode detector further including a capacitor connected between the anode and ground, and including a capacitor having a first contact connected to the anode and having a second contact defining an output of the Schottky diode detector; and a current source connected to the anode to drive current through the antenna and the Schottky diode in a direction from the anode to the cathode.

Another aspect of the invention provides a system comprising an antenna; a transponder including a receiver having a Schottky diode detector including a Schottky diode having a cathode coupled to the antenna and having an anode; and means for driving current through both the antenna and the Schottky diode in a direction from the anode to the cathode.

Another aspect of the invention provides a method for realizing an improved radio frequency detector for use in a radio frequency identification device, the method comprising the following steps: providing an integrated circuit and an antenna, the integrated circuit having a receiver and a transmitter, the integrated circuit further having a Schottky diode and a current source, with the Schottky diode in operation being coupled to the antenna and the current source, the Schottky diode and antenna cooperating there between to form an inductorless radio frequency detector; applying a supply of power to the integrated circuit device from a battery; and applying a desired current across the Schottky diode to impart a desired impedance there across relative to the impedance of the antenna.

Another aspect of the invention provides a frequency lock loop comprising a current controlled oscillator including a plurality of selectively engageable current mirrors, the frequency of oscillation of the frequency lock loop varying in response to selection of the current mirrors, the current mirrors including transistors operating in a subthreshold mode.

Another aspect of the invention provides an integrated circuit comprising a receiver, a transmitter, and a frequency lock loop including a current source having a thermal voltage generator, a current controlled oscillator having a plurality of selectively engageable current mirrors multiplying up the current of the current source, the frequency of oscillation of the frequency lock loop varying in response to selection of the current mirrors, the current mirrors including transistors operating in a subthreshold mode.

Another aspect of the invention provides a timing oscillator that consumes less than one milliamp.

Another aspect of the invention provides a method of constructing a frequency lock loop including a current controlled oscillator having a plurality of selectively engageable current mirrors, the frequency of oscillation of the frequency lock loop varying in response to selection of the current mirrors, the method comprising selecting current mirrors to vary frequency of operation, and operating transistors in the current mirrors in subthreshold mode.

Another aspect of the invention provides a method of operating an integrated circuit including a receiver, a transmitter, and a frequency lock loop including a current source having a thermal voltage generator, a current controlled oscillator having a plurality of selectively engageable current mirrors multiplying up the current of the current source, the frequency of oscillation of the frequency lock loop varying in response to selection of the current mirrors, the method comprising engaging selected current mirrors and operating transistors in the current mirrors in a subthreshold mode.

Another aspect of the invention provides an amplifier powered by a selectively engageable voltage source, the amplifier comprising first and second electrodes for receiving an input signal to be amplified, the input electrodes being adapted to be respectively connected to coupling capacitors; a differential amplifier having inputs respectively connected to the first and second electrodes, and having an output; selectively engageable resistances between the voltage source and respective inputs of the differential amplifier and defining, with the coupling capacitors, the high pass characteristics of the circuit; and second selectively engageable resistances between the voltage source and respective inputs of the differential amplifier, the second resistances respectively having iv smaller values that the first mentioned resistances, the second resistances being engaged then disengaged in response to the voltage source being engaged.

Another aspect of the invention provides a radio frequency identification device comprising an integrated circuit including a microprocessor, a receiver receiving radio frequency commands from an interrogation device, and a transmitter transmitting a signal identifying the device to the interrogator, the integrated circuit switching between a sleep mode, and a microprocessor on mode, in which more power is consumed than in the sleep mode, if the microprocessor determines that a signal received by the receiver is a radio frequency command from an interrogation device, the integrated circuit further including an amplifier powered by a selectively engageable voltage source engaged in the microprocessor on mode but not in the sleep mode, the amplifier including first and second electrodes for receiving an input signal to be amplified, the input electrodes being adapted to be respectively connected to coupling capacitors, a differential amplifier having inputs respectively connected to the first and second electrodes, and having an output, selectively engageable resistances between the voltage source and respective inputs of the differential amplifier, second selectively engageable resistances between the voltage source and respective inputs of the differential amplifier, the second resistances respectively having smaller values that the first mentioned resistances, the second resistances being engaged then disengaged in response to the integrated circuit switching from the sleep mode to the microprocessor on mode. Another aspect of the invention provides a method of speeding power up of an amplifier stage powered by a selectively voltage source and including first and second electrodes for receiving an input signal to be amplified, the input electrodes being adapted to be respectively connected to coupling capacitors; a differential amplifier having inputs respectively connected to the first and second electrodes, and having an output; and selectively engageable resistances between the voltage source and respective inputs of the differential amplifier, the method comprising: shorting around the selectively engageable resistances for a predetermined amount of time in response to the voltage source being engaged.

Another aspect of the invention provides a radio frequency communications system comprising an antenna; an integrated circuit including a receiver having a Schottky diode detector including a Schottky diode having an anode coupled to the antenna and having a cathode, the Schottky diode detector further including a capacitor connected between the cathode and ground, and including a capacitor having a first contact connected to the cathode and having a second contact defining an output of the Schottky diode detector, the integrated circuit further including a clock recovery circuit recovering a clock from rising edges only of a signal at the output of the Schottky diode detector; and a current source connected to drive current through the antenna and the Schottky diode in a direction from the anode to the cathode.

Another aspect of the invention provides a radio frequency communications system comprising an antenna; an integrated circuit including a receiver having a Schottky diode detector including a Schottky diode having a cathode coupled to the antenna and having an anode, the Schottky diode detector further including a capacitor connected between the anode and ground, and including a capacitor having a first contact connected to the anode and having a second contact defining an output of the Schottky diode detector, the integrated circuit further including a clock recovery circuit recovering a clock from falling edges only of a signal at the output of the Schottky diode detector; and a current source connected to drive current through the antenna and the Schottky diode in a direction from the anode to the cathode.

Another aspect of the invention provides a method of recovering a clock in a radio frequency communications system, the method comprising: providing an antenna; providing a receiver having a Schottky diode detector including a Schottky diode having an anode coupled to the antenna and having a cathode, the Schottky diode detector further including a capacitor connected between the cathode and ground, and including a capacitor having a first contact connected to the cathode and having a second contact defining an output of the Schottky diode detector; driving current through the antenna and the Schottky diode in a direction from the anode to the cathode; and recovering a clock from rising edges only of a signal at the output of the Schottky diode detector.

Another aspect of the invention provides a method of recovering a clock in a radio frequency communications system, the method comprising: providing an antenna; providing a receiver having a Schottky diode detector including a Schottky diode having a cathode coupled to the antenna and having an anode, the Schottky diode detector further including a capacitor connected between the anode and ground, and including a capacitor having a first contact connected to the anode and having a second contact defining an output of the Schottky diode detector; driving current through the antenna and the Schottky diode in a direction from the anode to the cathode; and recovering a clock from falling edges only of a signal at the output of the Schottky diode detector.

Another aspect of the invention provides a stage for a voltage controlled oscillator, the stage comprising a first transistor having a control electrode defining a first input, and having first and second power electrodes, the first power electrode defining a first node; a second transistor having a control electrode defining a second input, and having first and second power electrodes, the first power electrode of the second transistor defining a second node; a current source connected to the second power electrodes of the first and second transistors and directing current away from the second power electrodes of the first and second transistors; and means defining a variable resistance connecting the first and second nodes to a supply voltage.

Another aspect of the invention provides a stage for a voltage controlled oscillator, the stage comprising a first p-channel transistor having a gate defining a control node, having a source adapted to be connected to a supply voltage, and having a drain; a second p-channel transistor having a gate connected to the control node, having a source connected to the supply voltage, and having a drain; a first n-channel transistor having a gate defining a first input, having a drain connected to the drain of the first p-channel transistor and defining a first node, and having a source; a second n-channel transistor having a gate defining a second input, having a drain connected to the drain of the second p-channel transistor and defining a second node, and having a source; a current source connected to the sources of the first and second n-channel transistors directing current from the sources of the first and second n-channel transistors; a first resistor connected between the supply voltage and the drain of the first n-type transistor; a second resistor connected between the supply voltage and drain of the second n-type transistor; a first source follower having an input connected to the first node and having an output defining a first output of the stage; and a second source follower having an input connected to the second node and having an output defining a second output of the stage.

Another aspect of the invention provides a transmitter including a ring oscillator having a chain of stages, each stage comprising a first p-channel transistor having a gate defining a control node, having a source adapted to be connected to a supply voltage, and having a drain; a second p-channel transistor having a gate connected to the control node, having a source connected to the supply voltage, and having a drain; a first n-channel transistor having a gate defining a first input, having a drain connected to the drain of the first p-channel transistor and defining a first node, and having a source; a second n-channel transistor having a gate defining a second input, having a drain connected to the drain of the second p-channel transistor and defining a second node, and having a source; a current source connected to the sources of the first and second n-channel transistors directing current from the sources of the first and second n-channel transistors; a first resistor connected between the supply voltage and the drain of the first n-type transistor; a second resistor connected between the supply voltage and drain of the second n-type transistor; a first source follower having an input connected to the first node and having an output defining a first output of the stage; and a second source follower having an input connected to the second node and having an output defining a second output of the stage.

Another aspect of the invention provides a method of varying frequency in a stage of a voltage controlled oscillator having two input transistors having gates defining input nodes and having drain to source paths adapted to be connected between a supply voltage and a current source, the method comprising providing an impedance between the input transistors and the supply voltage, and varying the impedance.

Another aspect of the invention provides a frequency doubler comprising a first Gilbert cell; a second Gilbert cell coupled to the first Gilbert cell; a frequency generator configured to apply a first sinusoidal wave to the first Gilbert cell; and a phase shifter applying a sinusoidal wave shifted from the first sinusoidal wave to the second Gilbert cell.

Another aspect of the invention provides a frequency doubler comprising a first Gilbert cell including a first pair of transistors having sources that are connected together, a second pair of transistors having sources that are connected together, a first one of the transistors of the first pair having a gate defining a first input node and a first one of the transistors of the second pair having a gate connected to the first input node, a second one of the transistors of the first pair having a gate defining a second input node and a second one of the transistors of the second pair having a gate connected to the second input node, the first transistor of the first pair having a drain, and the second transistor of the second pair having a drain connected to the drain of the first transistor of the first pair, the second transistor of the first pair having a drain, and the first transistor of the second pair having a drain connected to the drain of the second transistor of the first pair, a third pair including first and second transistors having sources coupled together, the first transistor of the third pair having a drain connected to the source of the second transistor of the first pair, the second transistor of the third pair having a drain connected to the source of the second transistor of the second pair, and a current source connected to the sources of the third pair and forward biasing the third pair, the second transistor of the third pair having a gate defining a third input node, and the first transistor of the third pair having a gate defining a fourth input node; and a second Gilbert cell including a first pair of transistors having sources that are connected together, a second pair of transistors having sources that are connected together, a first one of the transistors of the first pair of the second cell having a gate defining a first input node and a first one of the transistors of the second pair of the second cell having a gate connected to the first input node of the second cell, a second one of the transistors of the first pair of the second cell having a gate defining a second input node of the second cell and a second one of the transistors of the second pair of the second cell having a gate connected to the second input node of the second cell, the first transistor of the first pair of the second cell having a drain, and the second transistor of the second pair of the second cell having a drain connected to the drain of the first transistor of the first pair of the second cell, the second transistor of the first pair of the second cell having a drain, and the first transistor of the second pair of the second cell having a drain connected to the drain of the second transistor of the first pair of the second cell, a third pair including first and second transistors having sources coupled together, the first transistor of the third pair of the second cell having a drain connected to the source of the second transistor of the first pair of the second cell, the second transistor of the third pair of the second cell having a drain connected to the source of the second transistor of the second pair of the second cell, and a current source connected to the sources of the third pair of the second cell and forward biasing the third pair of the second cell, the second transistor of the third pair of the second cell having a gate defining a third input node of the second cell, and the first transistor of the third pair of the second cell having a gate defining a fourth input node of the second cell; the drain of the second transistor of the first pair of the second cell being connected to the drain of the second transistor of the first pair of the first cell, the drain of the second transistor of the second pair of the second cell being connected to the drain of the second transistor of the second pair of the second cell, the first input node of the second cell being connected to the fourth input node of the first cell, the third input node of the second cell being connected to the second input node of the first cell, and the fourth input node of the second cell being connected to the first input node of the first cell.

Another aspect of the invention provides a method of doubling frequency without using a feedback loop, the method comprising: providing a first Gilbert cell; providing a second Gilbert cell coupled to the first Gilbert cell; applying a first sinusoidal wave to the first Gilbert cell; and applying a sinusoidal wave shifted from the first sinusoidal wave to the second Gilbert cell.

Another aspect of the invention provides a pseudo random number generator comprising a linear feedback shift register switchably operable in a first mode, and in a second mode wherein the shift register consumes more power than in the first mode.

Another aspect of the invention provides a method of generating a pseudo random number, the method comprising providing a linear feedback shift register; providing an oscillator which generates clock signals used by the linear feedback shift register for shifting; and providing a first power level to the oscillator when a pseudo random number is required, and providing a second power level, lower than the first power level, to the oscillator at other times. Another aspect of the invention provides a method of generating a pseudo random number, the method comprising: providing a linear feedback shift register; providing an oscillator which generates clock signals used by the linear feedback shift register for shifting; and operating the oscillator at a first frequency in response to a request for a pseudo random number, and operating the oscillator at a second frequency lower than the first frequency after the pseudo random number is generated.

Another aspect of the invention provides a system comprising a microprocessor operating at a frequency; a linear feedback shift register operable in a low power mode, wherein the shift register operates at a frequency below the frequency of the microprocessor, and a high power mode wherein the shift register consumes more power than in the low power mode, operates at the frequency of the microprocessor, and shifts data into the microprocessor.

Another aspect of the invention provides a radio frequency identification device comprising an integrated circuit including a receiver, a transmitter, a thermal voltage generator, a microprocessor operating at a frequency, a linear feedback shift register operable in a low power mode, wherein the shift register operates at a frequency below the frequency of the microprocessor, and a high power mode wherein the shift register consumes more power than in the low power mode, operates at the frequency of the microprocessor, and shifts data into the microprocessor, an oscillator supplying clock signals to the shift register, and current mirrors supplying current to each stage of the shift register, the current mirrors being referenced to the thermal voltage generator when the shift register is in the low power mode, and, when the shift register is in the high power mode, connected to a supply voltage potential greater than the potential provided by the thermal voltage generator.

Another aspect of the invention provides a method of generating a pseudo random number, the method comprising: providing a thermal voltage generator, a linear feedback shift register, an oscillator supplying clock signals to the shift register, and current mirrors supplying current to each stage of the shift register; referencing the current mirrors to the thermal voltage generator when no pseudo random number is required; and connecting the current mirrors to a supply voltage potential greater than the potential provided by the thermal voltage generator when a pseudo random number is required.

Another aspect of the invention provides an integrated circuit comprising a receiver and a transmitter sharing a common antenna. Another aspect of the invention provides a method of using an integrated circuit including a receiver and a transmitter, the method comprising connecting the receiver and transmitter to a common antenna.

Another aspect of the invention provides an integrated circuit comprising:

a die including a transmitter having an antenna output and a detector having an antenna input; a package housing the die; a first contact connected to the antenna output and accessible from outside the package; a second contact connected to the antenna input and accessible from outside the package; and a short electrically connecting the first contact to the second contact outside the package.

Another aspect of the invention provides a method of using an integrated circuit including a die having a transmitter including an antenna output and a detector including an antenna output, the integrated circuit further including a package housing the die, a first contact connected to the antenna output and accessible from outside the package, and a second contact connected to the antenna input and accessible from outside the package, the method comprising: electrically shorting the first contact to the second contact outside the package.

Another aspect of the invention provides a transceiver comprising an antenna having a first end connected to a bias voltage, and having a second end; a detector including a Schottky diode having an anode connected to the second end of the antenna; and a transmitter having an output connected to the second end of the antenna.

Another aspect of the invention provides a radio frequency identification device comprising an integrated circuit including both a receiver and a transmitter; a first antenna connected to the receiver; and a second antenna connected to the transmitter.

Another aspect of the invention provides a transceiver comprising a loop antenna having a first end connected to a bias voltage, and having a second end; a second antenna; a detector including a Schottky diode having an anode connected to the second end of the antenna; and a transmitter having an output connected to the second antenna.

Another aspect of the invention provides a transceiver comprising an antenna having a first end connected to a bias voltage, and having a second end; a detector including a Schottky diode having an anode connected to the second end of the antenna; and an active transmitter having an output connected to the second end of the antenna.

Another aspect of the invention provides a transceiver comprising an antenna having a first end, and having a second end; a detector including a Schottky diode having a cathode connected to the second end of the antenna and defining a potential at the second end of the antenna, the first end of the antenna being connected to a potential lower than the potential of the second end of the antenna; and a backscatter transmitter including a transistor having a first power electrode connected to the first end of the antenna, a second power electrode connected to the second end of the antenna, and a control electrode adapted to have a modulation signal applied thereto.

Another aspect of the invention provides a transceiver in accordance with claim and further comprising a current source directing current in the direction from the anode to the cathode.

Another aspect of the invention provides a transceiver comprising a loop antenna having a first end connected to a bias voltage, and having a second end; a detector including a Schottky diode having an anode connected to the second end of the antenna; a backscatter transmitter having a first output and having a second output; a capacitor connected between the first output and the first end of the antenna; and a capacitor connected between the second output and the second end of the antenna.

Another aspect of the invention provides a method of configuring a transceiver including a backscatter transmitter having first and second outputs, and a detector having a Schottky diode including an anode, the method comprising: applying a bias voltage to a first end of an antenna; connecting a second end of the antenna to the anode; connecting a capacitor between the first output and the first end of the antenna; and connecting a capacitor between the second output and the second end of the antenna.

Another aspect of the invention provides a method of arranging a transceiver including a backscatter transmitter and a detector having a Schottky diode including a cathode, the method comprising: connecting a first end of an antenna to a ground potential; connecting a second end of the antenna to the cathode; and connecting a first power electrode of a transistor to the first end of the antenna; connecting a second power electrode connected to the second end of the antenna; and connecting a control electrode of the transistor to a modulation signal.

Another aspect of the invention provides a method of determining when a phase lock loop achieves frequency lock relative to a desired frequency, the phase lock loop including a voltage controlled oscillator having a control node and oscillating at a frequency responsive to the voltage applied to the control node, the method comprising: crossing the voltage that would result in the phase lock loop tracking the desired frequency in a first direction; crossing the voltage that would result in the phase lock loop tracking the desired frequency in a second direction opposite the first direction; and indicating that frequency lock has been achieved.

Another aspect of the invention provides a method of determining when frequency lock occurs relative to a desired frequency, the method comprising:

providing a phase lock loop including a voltage controlled oscillator that oscillates at a frequency responsive to voltage applied to the voltage controlled oscillator; applying a voltage to the voltage controlled oscillator to produce a frequency of oscillation less than the desired frequency; increasing the voltage applied to the voltage controlled oscillator using one or more steps of a first size; increasing the voltage applied to the voltage controlled oscillator using one or more steps of a second size smaller than the first size; decreasing the voltage applied to the voltage controlled oscillator using one or more steps of a third size smaller than the second size; increasing the voltage applied to the voltage controlled oscillator using a step of the third size; and indicating that lock has occurred in response to the increase of the step of the third size.

Another aspect of the invention provides a method of determining when a phase lock loop achieves frequency lock relative to a desired frequency, the phase lock loop including a voltage controlled oscillator having a control node and oscillating at a frequency responsive to the voltage applied to the control node, the method comprising: increasing the voltage applied to the control node to a voltage above the voltage that would result in the phase lock loop tracking the desired frequency; decreasing the voltage applied to the control node to a voltage below the voltage that would result in the phase lock loop tracking the desired frequency; and increasing the voltage applied to the control node and indicating that frequency lock has been achieved.

Another aspect of the invention provides a radio frequency identification device comprising an integrated circuit including a microprocessor, a transmitter, and a receiver, the integrated circuit periodically switching between a sleep mode, and a receiver-on mode in which more power is consumed than in the sleep mode, and further including a selectively engageable timer preventing switching from the sleep mode to the receiver-on mode for a predetermined amount of time.

Another aspect of the invention provides a radio frequency identification device comprising an integrated circuit including a microprocessor, a transmitter, and a receiver, the integrated circuit periodically switching between a sleep mode, and a receiver-on mode in which more power is consumed than in the sleep mode, and further including means for selectively preventing switching from the sleep mode to the receiver-on mode for a predetermined amount of time.

Another aspect of the invention provides a radio frequency identification device comprising an integrated circuit including a microprocessor, a transmitter, and a receiver, the integrated circuit being switchable between a sleep mode, and a mode in which more power is consumed than in the sleep mode, the integrated circuit being switched from the sleep mode to the mode in which more power is consumed in response to a direct sequence spread spectrum modulated radio frequency signal being received by the receiver which has a predetermined number of transitions within a certain period of time, the integrated circuit further including a selectively engageable timer which prevents switching from the sleep mode for a period of time regardless of whether a signal is subsequently received by the receiver which has the predetermined number of transitions within a certain period of time.

Another aspect of the invention provides a method for conserving power in a radio frequency identification device, the method comprising: periodically switching from a sleep mode to a receiver on mode and performing tests to determine whether to further switch to a microprocessor on mode because a valid radio frequency signal is present; and selectively disabling the periodic switching from the sleep mode for a predetermined amount of time.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Overview of Device

Figure 1:
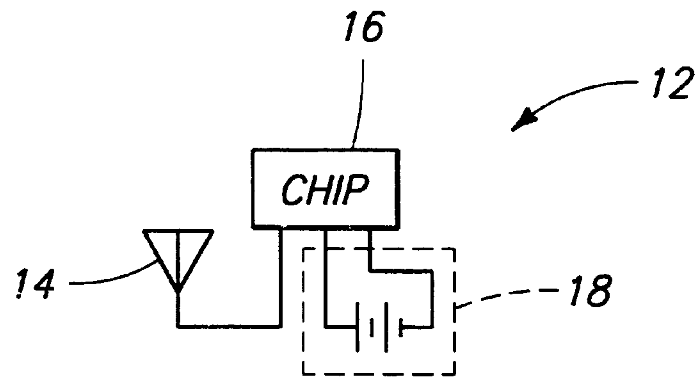
FIG. 1 is a high level circuit schematic showing a circuit embodying the invention.

FIG. 1 illustrates a radio frequency data communication device 12 embodying the invention. The radio frequency data communication device 12 includes an integrated circuit 16, a power source 18 connected to the integrated circuit 16 to supply power to the integrated circuit 16, and at least one antenna 14 connected to the integrated circuit 16 for radio frequency transmission and reception by the integrated circuit 16. For purposes of this disclosure, including the appended claims, the term "integrated circuit" shall be defined as a combination of interconnected circuit elements inseparably associated on or within a continuous [su]bstrate. For purposes of this disclosure, including the appended claims, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). For purposes of this disclosure, including the appended claims, the term "substrate" refers to any supporting structure, including, but not limited to, the semiconductive substrates described above. In the illustrated embodiment, the integrated circuit 16 is a monolithic integrated circuit. For purposes of this disclosure, including the appended claims, the term "monolithic integrated circuit" shall be defined as an integrated circuit wherein all circuit components are manufactured into or on top of a single chip of silicon. The integrated circuit 16 will be described in greater detail below. The power source 18 is a battery or other suitable power source.

Housing

The radio frequency data communication device 12 can be included in any appropriate housing or packaging.

Figure 2:
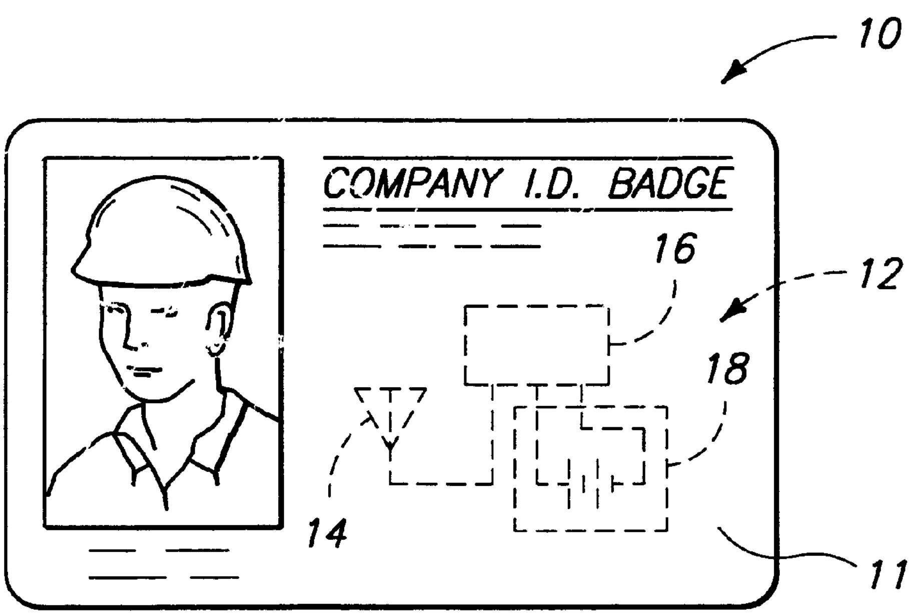
FIG. 2 is a front view of an employee badge according to but one embodiment the invention.

FIG. 2 shows but one example in the form of an employee identification badge 10 including the radio frequency data communication device 12, and a card 11 made of plastic or other suitable material. In one embodiment, the radio frequency data communication device 12 is laminated to the back face of the plastic card 11, and the card forms the visible portion of the badge. In another embodiment, the radio frequency data communication device 12 is bonded to the back face of the card by embedding it within a thin bond line of epoxy-based material. Alternatively, the radio frequency data communication device 12 is embedded into the plastic card 11. In one embodiment, the front face of the badge 10 has visual identification features including an employee photograph as well as identifying text.

Figure 3:
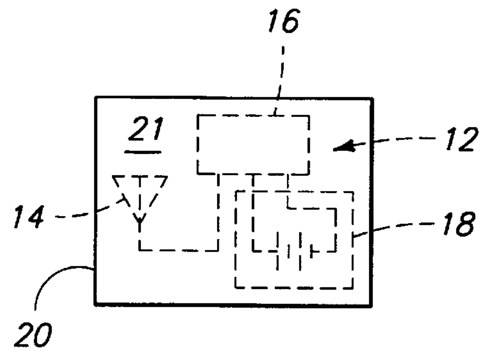
FIG. 3 is a front view of a radio frequency identification tag according to another embodiment of the invention.

FIG. 3 illustrates but one alternative housing supporting the device 12. More particularly, FIG. 3 shows a miniature housing 20 encasing the device 12 to define a tag which can be supported by an object (e.g., hung from an object, affixed to an object, etc.). The housing 20 preferably has the general shape and size, in plan view, of a postage stamp. The embodiment of FIG. 3 also includes a card 21 supporting the device 12 in the housing 20. The card 21 is formed of plastic or other suitable material having a thickness of about 0.040 inches, a width of about 1.25 inches, and a height of about 1.25 inches. In one embodiment, the device 12 is bonded to a back face of the card 21 with a thin layer of non-conductive epoxy material that cooperates with the card to define the housing 20.

Although two particular types of housings have been disclosed, the device 12 can be included in any appropriate housing. The device 12 is of a small size that lends itself to applications employing small housings, such as cards, miniature tags, etc. Larger housings can also be employed. The device 12, housed in any appropriate housing, can be supported from or attached to an object in any desired manner; for example using double sided tape, glue, lanyards, leash, nails, staples, rivets, or any other fastener. The housing can be sewn on to an object, hung from an object, implanted in an object (hidden), etc.

Antenna

Figure 5:
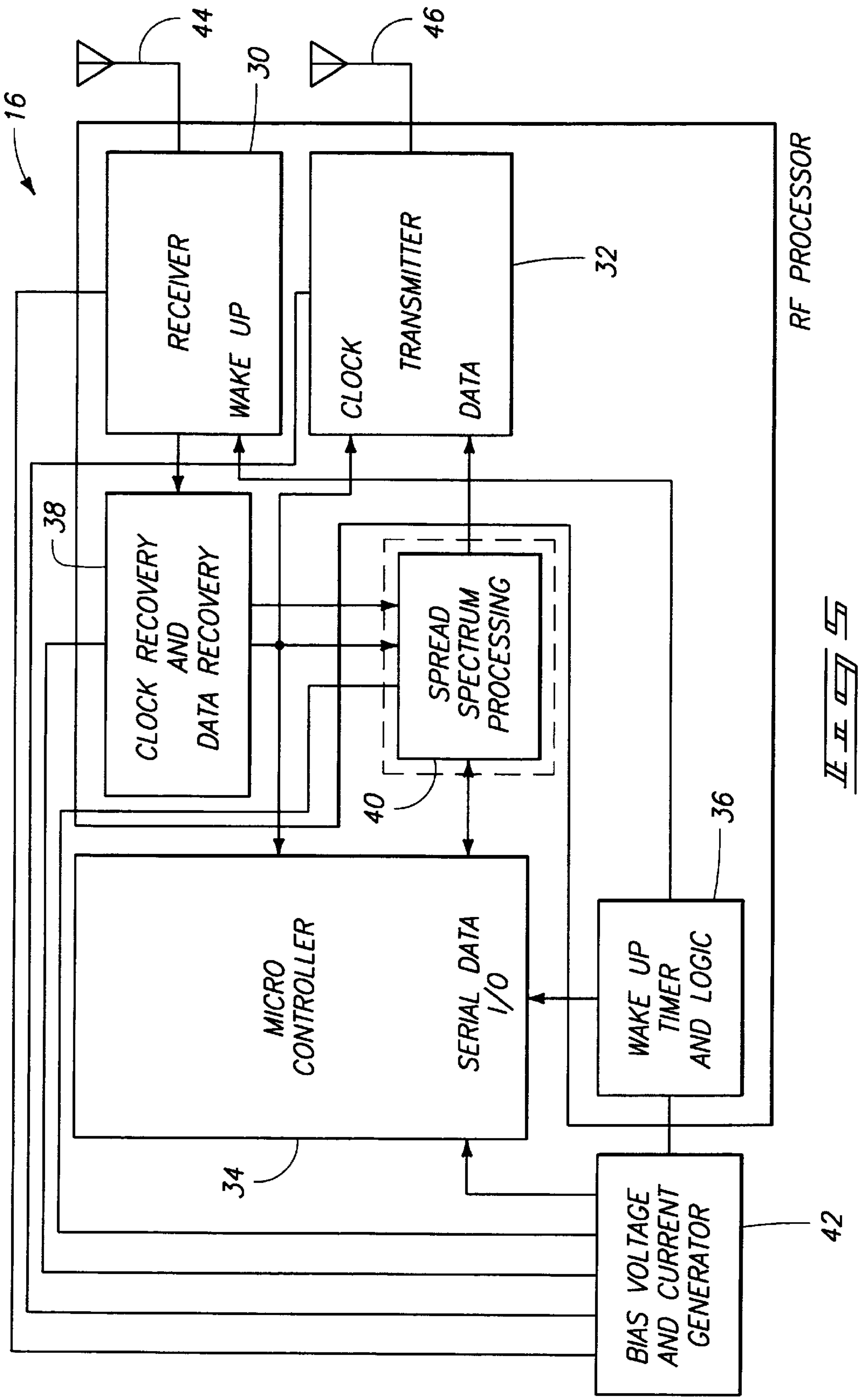
FIG. 5 is a high level circuit schematic of a monolithic semiconductor integrated circuit utilized in the devices of FIGS. 14.

Various configurations are possible for the antenna 14. The integrated circuit 16 includes a receiver 30 and a transmitter 32 (FIG. 5). In one embodiment, separate antennas 44 and 46 are provided for receiver and transmitter of the integrated circuit 16. In another embodiment (FIG. 1), a single antenna is shared by the receiver and transmitter sections. In one embodiment, the antenna is defined by conductive epoxy screened onto a card or housing. In the illustrated embodiment, the antenna is conductively bonded to the integrated circuit via bonding pads.

In an embodiment where a single antenna is employed, that single antenna preferably comprises a folded dipole antenna defining a continuous conductive path, or loop, of microstrip. Alternatively, the antenna can be constructed as a continuous loop antenna.

Battery

If the power source 18 is a battery, the battery can take any suitable form. Preferably, the battery type will be selected depending on weight, size, and life requirements for a particular application. In one embodiment, the battery 18 is a thin profile button-type cell forming a small, thin energy cell more commonly utilized in watches and small electronic devices requiring a thin profile. A conventional button-type cell has a pair of electrodes, an anode formed by one face and a cathode formed by an opposite face. Exemplary button-type cells are disclosed in several pending U.S. patent applications including U.S. patent application Ser. No. 08/205,957, "Button-Type Battery Having Bendable Construction and Angled Button-Type Battery," listing Mark E. Tuttle and Peter M. Blonsky as inventors now U.S. Pat. No. 5,432,027; U.S. patent application Ser. No. 08/321,251, "Button-Type Batteries and Method of Forming ButtonType Batteries," listing Mark E. Tuttle as inventor now U.S. Pat. No. 5,494,495; and U.S. patent application Ser. No. 08/348, 543, "Method of Forming Button-Type Batteries and a Button-Type Battery Insulating and Sealing Gasket," listing Mark E. Tuttle as inventor now U.S. Pat. No. 5,662,718. These patent applications and resulting patents are hereby incorporated by reference. In an alternative embodiment, the battery 18 comprises a series connected pair of button type cells. Instead of using a battery, any suitable power source can be employed.

Overview of Communication System

Figure 4:
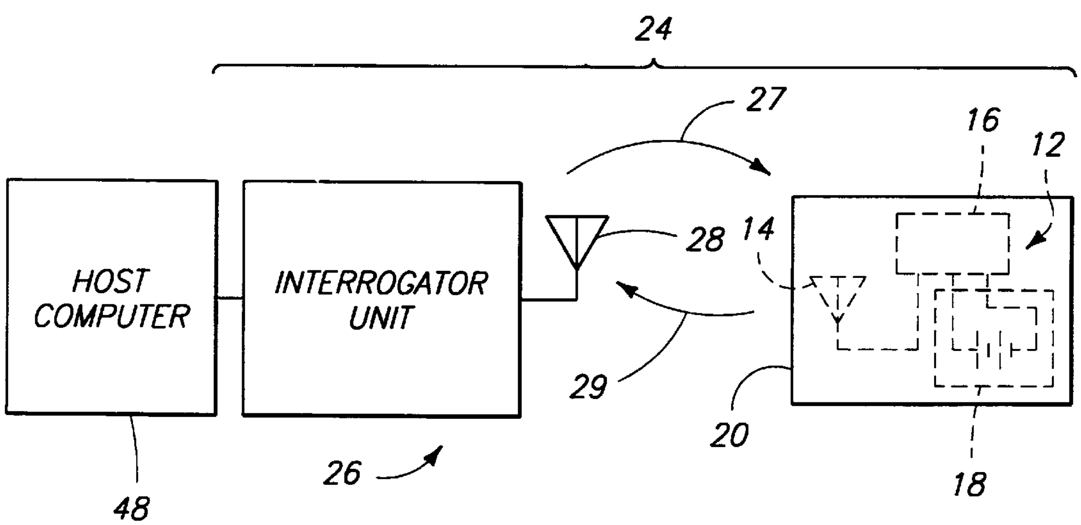
FIG. 4 is a block diagram of an electronic identification system according to the invention and including an interrogator and the tag of FIG. 3.

FIG. 4 illustrates a radio frequency communication system 24 including the device 12 and a radio frequency interrogator unit (hereinafter "interrogator) 26. The device 12 transmits and receives radio frequency communications to and from the interrogator 26. Preferably, the interrogator unit 26 includes an antenna 28, as well as dedicated transmitting and receiving circuitry, similar to that implemented on the integrated circuit 16. The system 24 further includes a host computer 48 in communication with the interrogator 26. The host computer 48 acts as a master in a master-slave relationship with the interrogator 26. The host computer 48 includes an applications program for controlling the interrogator 26 and interpreting responses, and a library ("MRL") of radio frequency identification device applications or functions. Most of the functions communicate with the interrogator 26. These functions effect radio frequency communication between the interrogator 26 and the device 12. These functions are described below in a section titled "Protocol."

One example of an interrogator implemented in combination with a transponder unit is disclosed in U.S. Pat. No. 4,857,893, hereby incorporated by reference. Generally, the interrogator 26 includes an antenna 28, and transmits an interrogation signal or command 27 ("forward link") via the antenna 28. The device 12 receives the incoming interrogation signal via its antenna 14. Upon receiving the signal 27, the device 12 responds by generating and transmitting a responsive signal or reply 29 ("return link"). Preferably, the responsive signal 29 is encoded with information that uniquely identifies, or labels the particular device 12 that is transmitting, so as to identify any object or person with which the device 12 is associated.

In the illustrated embodiment in FIG. 4, there is no communication between devices 12. Instead, the devices 12 communicate with the interrogator 26. FIG. 4 illustrates the device 12 as being in the housing 20 of FIG. 3. The system 24 would operate in a similar manner if the device 12 is provided in a housing such as the housing 10 of FIG. 2, or any other appropriate housing. Multiple devices 12 can be used in the same field of an interrogator 26 (i.e., within communications range of an interrogator 26). Similarly, multiple interrogators 26 can be in proximity to one or more of the devices 12.

Various U.S. patent applications, which are incorporated herein by reference, disclose features that are employed in various alternative embodiments of the invention: Ser. No. 08/092,147, filed Jul. 15, 1993, "Wake Up Device for a Communications System now abandoned" and continuation application Ser. No. 08/424,827, filed Apr. 19, 1995, "Wake Up Device for a Communications System now U.S. Pat. No. 5,790,946"; Ser. No. 08/281,384, filed Jul. 27, 1994, "Communication System Having Transmitter Frequency Control now U.S. Pat. No. 5,568,512"; Ser. No. 07/990,918, filed Dec. 15, 1992, now U.S. Pat. No. 5,365,551, "Data Communication Transceiver Using Identification Protocol"; Ser. No. 07/899,777, filed Jun. 17, 1992, "Radio Frequency Identification Device (RFID) and Method of Manufacture, Including an Electrical Operating System and Method," now abandoned; Ser. No. 07/921,037, filed Jul. 24, 1992, "Anti-Theft Method for Detecting The Unauthorized Opening of Containers and Baggage," now abandoned; Ser. No. 07/928, 899, filed Aug. 12, 1992, "Electrically Powered Postage Stamp or Mailing or Shipping Label Operative with Radio Frequency (RF) Communications," now abandoned; and Ser. No. 08/032,384, filed on Mar. 17, 1993, "Modulated Spread Spectrum in RF Identification Systems Method," now U.S. Pat. No. 5,539,775.

The above described system 24 is advantageous over prior art devices that utilize magnetic field effect systems because, with the system 24, a greater range can be achieved, and more information can be obtained (instead of just an identification number).

As a result, such a system 24 can be used, for example, to monitor large warehouse inventories having many unique products needing individual discrimination to determine the presence of particular items within a large lot of tagged products. The system can also be used to counteract terrorism to monitor luggage entering a plane to ensure that each item of luggage that enters the plane is owned by a passenger who actually boards the plane. Such a technique assumes that a terrorist will not board a plane that he or she is planning to bomb. The system 24 is useful whenever RF transmission over a large range is desirable, such as for inventory control. In one embodiment, the sensitivity of the devices 12 is adjustable so that only devices within a certain range of the interrogator 26 will respond. In another embodiment, the power of the interrogator 26 is adjustable so that only devices within a certain range of the interrogator 26 will respond.

However, a power conservation problem is posed by such implementations where batteries are used to supply power to the integrated circuits 16. If the integrated circuit 16 operates continuously at full power, battery life will be short, and device 12 will have to be frequently replaced. If the battery 18 is permanently sealed in a housing, replacement of the battery will be difficult or impossible. For example, one reason for sealing the battery with the integrated circuit 16 and antenna 14 in a housing is to simplify the design and construction, to reduce the cost of production, and protect the electrical interconnections between devices. Another reason is protection of the battery and integrated circuit 16 from moisture and contaminants. A third reason is to enhance the cosmetic appeal of the device 12 by eliminating the need for an access port or door otherwise necessary to insert and remove the battery. When the battery is discharged, the entire badge or stamp is then discarded. It is therefore desirable in this and other applications to incorporate power conservation techniques into the integrated circuit 16 in order to extend useful life.

In one embodiment, the devices 12 switch between a 'sleep" mode of operation, and higher power modes to conserve energy and extend battery life during periods of time where no interrogation signal 27 is received by the device 12. These power conservation techniques are described in greater detail below.

In one embodiment of the invention, in order to further extend the life of the battery 18, the receiver sensitivity of the device 12 is tuned over a range of tuned and detuned states in order to modify the ability of the device to detect signal 27, and therefore adjust the tendency for the device to wake up. One way to adjust the receiver sensitivity is by adjusting the sensitivity, or impedance of the antenna. Another way is by controlling the gain of amplifiers included in the receiver. Another way is to adjust or switch in different circuit elements in the device 12, thereby realizing different circuit configurations. Additionally, the transmitting sensitivity for the device 12 can be adjusted. For example, transmitting range can be adjusted by controlling interrogator continuous wave power if the transmitter is operating in backscatter mode, and by controlling output power if the transmitter is in active mode.

Overview of Integrated Circuit

FIG. 5 is a high level circuit schematic of the integrated circuit 16 utilized in the devices of FIGS. 1–4. In the embodiment shown in FIG. 5, the integrated circuit 16 is a monolithic integrated circuit. More particularly, in the illustrated embodiment, the integrated circuit 16 comprises a single die, having a size of 209×116 $mils^2$, including the receiver 30, the transmitter 32, a micro controller or microprocessor 34, a wake up timer and logic circuit 36, a clock recovery and data recovery circuit 38, and a bias voltage and current generator 42.

In one embodiment, a spread spectrum processing circuit 40 is also included in the integrated circuit 16 and formed relative to the single die. In this embodiment, signals received by the receiver 30 are modulated spread spectrum signals. Spread spectrum modulation is described below. In the illustrated embodiment, the modulation scheme for replies sent by the transmitter 32 is selectable. One of the available selections for replies sent by the transmitter 32 is modulated spread spectrum.

Spread Spectrum Modulation

Many modulation techniques minimize required transmission bandwidth. However, the spread spectrum modulation technique employed in the illustrated embodiment requires a transmission bandwidth that is up to several orders of magnitude greater than the minimum required signal bandwidth. Although spread spectrum modulation techniques are bandwidth inefficient in single user applications, they are advantageous where there are multiple users, as is the case with the instant radio frequency identification system 24. The spread spectrum modulation technique of the illustrated embodiment is advantageous because the interrogator signal can be distinguished from other signals (e.g., radar, microwave ovens, etc.) operating at the same frequency. The spread spectrum signals transmitted by the device 12 and by the interrogator 26 (FIG. 4) are pseudo random and have noise-like properties when compared with the digital command or reply. The spreading waveform is controlled by a pseudo-noise or pseudo random number (PN) sequence or code (described below). The PN code is a binary sequence that appears random but can be reproduced in a predetermined manner by the device 12. More particularly, incoming spread spectrum signals are demodulated by the device 12 through cross correlation with a version of the pseudo random carrier that is generated by the device 12 itself. Cross correlation with the correct PN sequence unspreads the spread spectrum signal and restores the modulated message in the same narrow band as the original data.

A pseudo-noise or pseudo random sequence (PN sequence) is a binary sequence with an autocorrelation that resembles, over a period, the autocorrelation of a random binary sequence. The autocorrelation of a pseudo-noise sequence also roughly resembles the autocorrelation of band-limited white noise. A pseudo-noise sequence has many characteristics that are similar to those of random binary sequences. For example, a pseudo-noise sequence has a nearly equal number of zeros and ones, very low correlation between shifted versions of the sequence, and very low cross correlation between any two sequences. A pseudo-noise sequence is usually generated using sequential logic circuits. For example, a pseudo-noise sequence can be generated using a feedback shift register.

A feedback shift register comprises consecutive stages of two state memory devices, and feedback logic. Binary sequences are shifted through the shift registers in response to clock pulses, and the output of the various stages are logically combined and fed back as the input to the first stage. The initial contents of the memory stages and the feedback logic circuit determine the successive contents of the memory.

The illustrated embodiment employs direct sequence spread spectrum modulation. A direct sequence spread spectrum (DSSS) system spreads the baseband data by directly multiplying the baseband data pulses with a pseudo-noise sequence that is produced by a pseudo-noise generator. A single pulse or symbol of the PN waveform is called a "chip." Synchronized data symbols, which may be information bits or binary channel code symbols, are added in modulo-2 fashion to the chips before being modulated. The receiver performs demodulation. For example, in one embodiment the data is phase modulated, and the receiver performs coherent or differentially coherent phase-shift keying (PSK) demodulation. In another embodiment, the data is amplitude modulated. Assuming that code synchronization has been achieved at the receiver, the received signal passes through a wideband filter and is multiplied by a local replica of the PN code sequence. This multiplication yields the unspread signal.

A pseudo-noise sequence is usually an odd number of chips long. In the illustrated embodiment, one bit of data is represented by a thirty-one chip sequence. A zero bit of data is represented by inverting the pseudo-noise sequence.

Spread spectrum techniques are also disclosed in the following patent applications and patent, which are incorporated herein by reference: U.S. patent application Ser. No. 08/092,147; U.S. patent application Ser. No. 08/424,827, filed Apr. 19, 1995; and U.S. Pat. No. 5,121,407 to Partyka et al. They are also disclosed, for example, in "Spread Spectrum Systems," by R. C. Dixon, published by John Wiley and Sons, Inc.

The system disclosed in U.S. patent application Ser. No. 08/092,147 includes two receivers, a low power receiver for detecting a wake up signal from an interrogator, and a high power receiver for receiving commands from an interrogator. On the other hand, the integrated circuit 16 of the illustrated embodiment employs a single receiver for both wake up and receiving commands from an interrogator. Another difference is that in the system 12 of the illustrated embodiment the receiver, not the interrogator, controls wake up. In the system 24 of the illustrated embodiment, the integrated circuit 16 includes a timer that causes the receiver and support circuitry to be powered on periodically. This is described in greater detail elsewhere.

Backscatter and Frequency Hopping

The interrogator sends out a command that is spread around a certain center frequency (e.g, 2.44 GHz). After the interrogator transmits the command, and is expecting a response, the interrogator switches to a CW mode (continuous wave mode). In the continuous wave mode, the interrogator does not transmit any information. Instead, the interrogator just transmits 2.44 GHz radiation. In other words, the signal transmitted by the interrogator is not modulated. After the device 12 receives the command from the interrogator, the device 12 processes the command. If the device 12 is in a backscatter mode it alternately reflects or does not reflect the signal from the interrogator to send its reply. For example, in the illustrated embodiment, two halves of a dipole antenna are either shorted together or isolated from each other, as described below in greater detail. In the illustrated embodiment, frequency hopping does not occur when the interrogator transmits a command, but occurs when the interrogator is in the continuous wave mode. The interrogator, in the continuous wave mode, hops between various frequencies close to the 2.44 GHz frequency. These various frequencies are sufficiently close to the 2.44 GHz frequency that backscatter antenna reflection characteristics of the device 12 are not appreciably altered. Because the interrogator is hopping between frequencies, the interrogator knows what frequency backscatter reflections to expect back from the device 12. By hopping between various frequencies, the amount of time the interrogator continuously uses a single frequency is reduced. This is advantageous in view of FCC regulatory requirements.

In the illustrated embodiment, no attempt is made to frequency hop at the interrogator to a pseudo-random sequence and then correlate to that at the receiver. However, in alternative embodiments, such correlation takes place.

CMOS Process

The integrated circuit 16 is formed according to semiconductor wafer processing steps, such as CMOS semiconductor wafer processing steps used to form static random access memories. In the preferred embodiment, the integrated circuit 16 is a single metal integrated circuit. In other words, the integrated circuit 16 is formed using a single metal layer processing method. More particularly, only one layer of metal (e.g., aluminum) is employed. This is advantageous in that it results in a lower cost of production.

In this processing method, a p-type wafer is employed. The processing method employed provides n-well areas used to define p-channel transistors; an active area which is used to define p+ and n+ diffused regions inside the p-type wafer or inside the n-well areas. Next, a layer is provided that helps prevent leakage between adjacent devices. Then, transistor are defined by forming n-type and p-type polysilicon. Then, a contact layer is defined for connecting desired intersections of polysilicon with metal (aluminum) that is subsequently formed. The contact layer is also used, in some instances, for connecting desired intersections of the metal that is subsequently formed with active area. Then the metal layer is formed. The contact layer provides a means for connecting metal with layers below the metal. Then, a passivation step is performed. Passivation means that the die is covered with a protective layer and holes are cut around the edge of the die so that electrical connection can be made to the bond pads.

In some processing, after the metal layer is formed, an insulating layer is provided, and another layer of aluminum is formed above the insulating layer. Holes are provided at selected locations to interconnect the top layer of aluminum with lower layers. An advantage of using multiple layers of metal is that it provides greater flexibility in how functional blocks are laid out and in how power is bused to various areas. However, multiple metal layers add processing steps. This results in added cost and complexity.

The process of the preferred embodiment employs only one layer of metal, and is therefore a relatively simple, inexpensive process.

The following U.S. patents, which are incorporated herein by reference, disclose CMOS processing techniques that are employed in various alternative embodiments of the invention: U.S. Pat. No. 5,489,546 to Ahmad et al.; U.S. Pat. No. 5,272,367 to Dennison et al.; and U.S. Pat. No. 5,134,085 to Gilgen et al.

Various other processing methods can be employed in alternative embodiments.

Transmitter and Receiver

The receiver 30 is a radio frequency receiver included in the integrated circuit 16, and the transmitter 32 is a radio frequency transmitter included in the integrated circuit 16. In one embodiment, the receiver 30 includes a Schottky diode detector. Various forms of Schottky diode detectors are described in a paper titled "Designing Detectors for RFIID Tags," by Raymond W. Waugh of Hewlett-Packard Company, submitted for presentation at the RF Expo, San Diego, Feb. 1, 1995, and incorporated herein by reference.

The receiver 30 of the illustrated embodiment makes use of the rate or frequency of data included in incoming signals, but does not make use of the carrier frequency of the incoming signal. In other words, operation of the receiver 30 is independent of the frequency of the carrier of the incoming signal over a wide range of carrier frequencies.

Therefore, the device 12 can operate over a wide range of carrier frequencies. For example, the device 12 can operate with carriers of 915–5800 MHZ. In a more, particular embodiment, the device 12 can operate with carrier frequencies in the 915, 2450, or 5800 MHZ bands. In the illustrated embodiment, the antennas are half wave antennas, and frequency selectivity of the device 12 is achieved based on selection of the antenna external to the integrated circuit 16. Capacitors employed in the Schottky diode detector are also selected based on the carrier frequency that will be employed.

In one embodiment, the transmitter 32 is switchable between operating in a modulated backscatter transmitter mode, and operating in an active mode. The transmitter 32 switches between the backscatter mode and the active mode in response to a radio frequency command, instructing the transmitter to switch, sent by the interrogator 26 and received by the receiver 30. In the active mode, a carrier for the transmitter is extracted from a signal received by the receiver 30.

Active transmitters are known in the art. See, for example, U.S. patent application Ser. No. 08/281,384. U.S. patent application Ser. No. 08/281,384 also discloses how transmit frequency for the transmitter 32 is recovered from a message received via radio frequency from the a interrogator 26. The device 12 differs from the device disclosed in U.S. patent application Ser. No. 08/281,384 in that a VCO control voltage is stored as an analog voltage level on a capacitor instead of as a digital number in a register. Further, in the illustrated embodiment, the recovered frequency is also used by the integrated circuit 16 to generate a DPSK subcarrier for modulated backscatter transmission.

The transmitter is capable of transmitting using different modulation schemes, and the modulation scheme is selectable by the interrogator. More particularly, if it is desired to change the modulation scheme, the interrogator sends an appropriate command via radio frequency. The transmitter can switch between multiple available modulation schemes such as Binary Phase Shift Keying (BPSK), Direct Sequence Spread Spectrum, On-Off Keying (OOK), and Modulated Backscatter (MBS).

Wake Up Timer and Logic Circuit

The integrated circuit 16 includes the wake up timer and logic circuit 36 for conserving battery power. More particularly, the integrated circuit 16 normally operates in a sleep mode wherein most circuitry is inactive and there is a very low current draw on the battery 18. One circuit that is active during the sleep mode is a timer for waking up the integrated circuit at predetermined intervals. In the illustrated embodiment, the interval is 16 milliseconds; however, various other intervals can be selected by radio frequency by sending a message from the interrogator 26 to the device 12. For example, in the illustrated embodiment, the interval is selectable as being 0.5, 16, 64 or 256 milliseconds.

Assuming the selected interval is 16 milliseconds, after every sleep period of 16 milliseconds the wake up timer and logic circuit 36 activates the receiver 30, the clock recovery and data recovery circuit 38, and all the bias currents and voltages associated with the receiver 30. This is a receiver on mode, illustrated by a vertical line marked WAKEUP RX ON in FIG. 27. Such bias currents and voltages are generated by the bias voltage and current generator 42. The receiver 30 then determines if there is a radio frequency signal present.

If there is no radio frequency signal present, the wake up timer and logic circuit 36 deactivates the receiver 30 and clock recovery and data recovery circuit 38. The receiver then goes back to sleep in the low current mode until another 16 milliseconds pass (or whatever sleep period is selected).

If there is a radio frequency signal present, the receiver will unspread the spread spectrum signal for processing. It is possible that while the receiver is on, it may detect a radio frequency signal from a source other than the interrogator 26. For example, other radio frequency transmitting devices may be operating in the area. In the illustrated embodiment, the receiver is set to receive microwave frequency signals, so that a small antenna can be used. Therefore, the wake up timer and logic circuit 36 performs tests to determine if a radio frequency signal received on wake up is valid. This is a wake up abort test mode, illustrated by a vertical line marked WAKEUP ABORT TESTS in FIG. 27. If the wake up timer and logic circuit 36 determines that the incoming signal is not valid, the integrated circuit 16 returns to the sleep mode. The illustrated integrated circuit 16 consumes approximately one micro amp in the sleep mode, and the battery 18 is expected to last up to 10 years with a current drain of that order, depending on how often radio frequency signals are present and on the capacity of the battery.

If a radio frequency signal is detected upon wake up, the wake Up timer and logic compares the incoming signal to known characteristics of expected spread spectrum encoded data. In the illustrated embodiment, a valid incoming radio frequency signal will be a spread spectrum signal having a thirty-one chip code representing a single data bit. To represent a digital one ("1") the thirty-one chip code is sent as is. To represent a digital zero ("0") the thirty-one chip code is inverted. The wake up timer and logic circuit 36 knows how many transitions there are in a valid thirty-one chip sequence, and knows the time period within which all those transitions are expected (or the frequency of the transitions). After the incoming radio frequency signal is amplified and converted to baseband, it is tested against known characteristics of a valid signal.

If the incoming signal does not pass these tests, the integrated circuit 16 returns to the sleep mode. If the incoming signal does pass these tests, then the wake up timer and logic circuit determines whether the clock recovery and data recovery circuit 38 locks on to the clock frequency contained in the chip rate of the incoming signal within a predetermined time period. If frequency lock is obtained, the microprocessor is turned on for processing of the received command. this is a processor on mode illustrated by a vertical line marked "PROCESSOR ON" in FIG. 27.

If frequency lock is not obtained within the predetermined time, the integrated circuit 16 returns to the sleep mode.

Other appropriate tests can be performed in embodiments where spread spectrum is not employed. In these embodiments, knowing how valid data is encoded, the wake up timer and logic still compares the number of transitions received in a given amount of time with an expected number of transitions for a valid signal.

In summary, various tests are performed, and the order in which they are performed is preferably selected to most quickly identify invalid signals. U.S. patent application Ser. No. 08/424,827, filed Apr. 19, 1995 and U.S. patent application Ser. No. 08/092,147, which are incorporated herein by reference, disclose tests that could be employed in various alternative embodiments of the invention.

After the wake up timer and logic circuit 36 determines that a received signal is valid, the integrated circuit 16 then performs clock recovery. To save space and cost, the preferred device 12 does not include a crystal timing element (clock). Instead, all timing for the device 12 is extracted from valid incoming signals received by the receiver 30. In one embodiment, a valid incoming radio frequency signal is digital, and starts with a preamble, which is followed by a start code (or Barker code), which is followed by data (e.g., a command). For example, in the illustrated embodiment, the preamble is a long (e.g., eighteen milliseconds) string of zeros; i.e., the thirty-one chip sequence is inverted, and sent repeatedly for approximately 18 milliseconds. In the illustrated embodiment the data or command after the Barker code is shorter than the preamble, and is approximately 4 milliseconds long.

Clock Recovery and Data Recovery Circuit

The clock for the entire integrated circuit 16 is extracted from the incoming message itself. In one embodiment, the transmitter 32 is selectable as being operable in an active transmission mode, or a backscatter mode. If the transmitter 32 is operating in an active mode, the extracted clock is multiplied up to the carrier frequency of the transmitter 32. For example, in one embodiment, the transmitter carrier frequency is 2.44 GHz. The choice of chip rate is a function of the carrier frequency and the carrier frequency has to be divisible by a power of two to give the chip rate on the input.

If the transmitter 32 is operating in a backscatter mode, the clock that has been recovered from the incoming signal received by the receiver 30 is divided to make it slower and is then used for frequency shift key or phase shift key modulated backscatter.

In summary, a clock is recovered from the incoming message, and used for timing for the micro controller 34 and all the other clock circuitry on the chip, and also for deriving the transmitter carrier or the subcarrier, depending on whether the transmitter is operating in active mode or backscatter mode.

Note that there are disadvantages to generating a transmit frequency in this fashion. In an alternative embodiment (not shown), a crystal is employed to generate a clock. A crystal provides a more stable, reliable clock to generate the transmit frequency, but also increases cost and size of the device 12.

In addition to recovering a clock, the clock recovery and data recovery circuit 38 also performs data recovery on valid incoming signals. The valid spread spectrum incoming signal is passed through the spread spectrum processing circuit 40, and the spread spectrum processing circuit 40 extracts the actual ones and zeros of data from the incoming signal. More particularly, the spread spectrum processing circuit 40 takes the chips from the spread spectrum signal, and reduces each thirty-one chip section down to a bit of one or zero, which is passed to the micro controller 34.

Micro Controller

The micro controller 34 includes a serial processor, or I/O facility that received the bits from the spread spectrum processing circuit 40. The micro controller 34 performs further error correction. More particularly, a modified hamming code is employed, where each eight bits of data is accompanied by five check bits used by the micro controller 34 for error correction. The micro controller 34 further includes a memory, and after performing the data correction, the micro controller 34 stores bytes of the data bits in memory. These bytes contain a command sent by the interrogator 26. The micro controller 34 responds to the command.

For example, the interrogator 26 may send a command requesting that any device 12 in the field respond with the device's identification number. Status information is also returned to the interrogator 26 from the device 12 when the device 12 responds.

Unalterable Identification

In one embodiment, the integrated circuit 16 includes unalterable indicia (a signature), different from the device's identification number discussed above. The unalterable indicia is burned into programmable read only memory or formed using a laser operating on fusible links. The unalterable indicia is indicative of the history of the particular die used to manufacture the integrated circuit 16. For example, in the illustrated embodiment, the unalterable indicia includes a lot number, wafer number, and die number of the die used to manufacture the integrated circuit 16. This information is transmitted by the transmitter in response to a manufacturer's command received by the receiver. In one embodiment, the manufacturer's command is a controlled access, or secret command that is not readily ascertainable by the public or purchaser/user of the device. This unalterable indicia can be used to trace manufacturing problems in defective devices 12, or to locate stolen products carrying a device 12.

Arbitration

If the interrogator 26 sends out a command requesting that all devices 12 within range identify themselves, and gets a large number of simultaneous replies, the interrogator 26 may not able to interpret any of these replies. Further, there may be multiple interrogators in an area trying to interrogate the same device 12.

Therefore, arbitration schemes are provided. With the more common scenario of multiple devices 12 trying to respond to an interrogator, the interrogator 26 sends a command causing each device 12 of a potentially large number of responding devices 12 to select a random number from a known range and use it as that device's arbitration number. By transmitting requests for identification to various subsets of the full range of arbitration numbers, and checking for an error-free response, the interrogator 26 determines the arbitration number of every responder station capable of communicating at the same time. Therefore, the interrogator 26 is able to conduct subsequent uninterrupted communication with devices 12, one at a time, by addressing only one device 12.

If the interrogator 26 has prior knowledge of the identification number of a device 12 which the interrogator 26 is looking for, it can specify that a response is requested only from the device 12 with that identification number.

Arbitration schemes are discussed below, in greater detail, in connection with protocols.

U.S. Pat. No. 5,365,551 to Snodgrass et al., which is incorporated by reference, discloses arbitration schemes that could be employed in various alternative embodiments of the invention.

Reply

After the micro controller processes a command from the interrogator 26, the micro controller formats the reply as specified in the protocol and the formatted reply leaves the micro controller via a serial data port of the micro controller. If desired, the formatted reply is spread spectrum encoded by the spread spectrum processing circuit 40. The reply is then modulated by the transmitter 32. The transmitter 32 is capable of transmitting using different modulation schemes, and the modulation scheme is selectable by the interrogator 26. More particularly, if it is desired to change the modulation scheme, the interrogator 26 sends an appropriate command via radio frequency.

The transmitted replies have a format similar to the format of incoming messages. More particularly, a reply starts with a preamble (e.g., all zeros in active mode, or alternating double zeros and double ones in backscatter mode), followed by a Barker or start code which is thirteen bits long, followed by actual data.

No stop bits are included in the incoming message or reply, in the preferred embodiment. Instead, part of the incoming message describes how many bytes are included, so the integrated circuit 16 knows how much information is included. Similarly, part of the outgoing reply describes how many bytes are included, so the interrogator 12 knows how much information is included. The incoming message and outgoing reply preferably also include a check sum or redundancy code so that the integrated circuit 16 or the interrogator 12 can confirm receipt of the entire message or reply.

After the reply is sent, the integrated circuit 16 returns to the sleep mode, and the wake up timer and logic circuit 36 starts timing again for the next wake up (e.g., in 16 milliseconds, or whatever period is selected).

Detailed Circuit Schematics

FIG. 6 is a graph illustrating how FIGS. 6AA–EK are to be assembled.

FIGS. 6AA–EK include circuitry partitioned in blocks in a manner that is somewhat different from the way the blocks are partitioned in FIG. 5. In some ways FIGS. 6AA–EK shows less detail than in FIG. 5, and in some ways they show more detail.

The integrated circuit 16 is shown as including an analog processor "anlgproc," an RF processor "rfproc," a PN (pseudo random number) processor "pnproc," a data processor "dataproc," and return link configuration logic "rlconfig."

The data processor "dataproc" shown in FIGS. 6AA–EK is the micro controller or microprocessor 34 of FIG. 5. The data processor "dataproc" is shown in greater detail in FIG. 7. In the illustrated embodiment, the data processor "dataproc" is an eight bit processor, and includes a ROM "rom," a RAM "ram," a serial I/O block "sio," an eight bit ALU (arithmetic logic unit) "alu," an instruction decoder programmable logic array "insdec," and address decoder "adrdec," a clock generator "clk," a conditional qualifier decoder "cqualdec," a databus latch/precharge circuit "dblatch," a timed lockout divider "tld," a data interleaver (which interleaves two thirteen bit words) "dil," a convolutional encoder and preamble generator "conv," a digital port output controller "doutport," a shift register input data multiplexer "shdel" and a series of registers. In the illustrated embodiment, the registers include a timed lockout register "tloreg," a plurality of status registers "sreg," a plurality of read/write control registers "oreg," and an instruction register "insreg."

The registers are used to drive control lines to various different circuits to allow the data processor to have control over those circuits. The "sio" block (described below) is the data path for data received and for the data to be transmitted.

FIG. 6.01 is a layout diagram illustrating the physical layout of various components on an integrated circuit die, in accordance with one embodiment of the invention. The physical locations and sizes of components relative to other components are shown. Boundaries between various blocks may be approximate in the sense that portions of certain blocks may extend into other blocks. The layout diagram illustrates that separate analog and digital ground returns are provided. In the illustrated embodiment, the ground return for the receiver and transmitter is spaced apart from the receiver and transmitter. However, in an alternative embodiment, locating the ground return for the receiver and transmitter proximate the receiver and transmitter may provide improved results. In the preferred embodiment, the transmitter and receiver circuitry is physically located on the die close to an edge, proximate to the bond pads. More particularly, the microwave outputs of the transmitter 32 are arranged on the die so as to be next to (in close physical proximity to) the appropriate bond pads. Also shown in FIG. 6.01 are small squares adjacent the receiver and active transmitter pads, respectively. These are ground pads for microwave probing, in the exemplary embodiment. In an alternative embodiment, these microwave probing ground pads can be employed as functional ground pads instead of using the illustrated common analog ground pad.

FIG. 7.01AA–BB provide a circuit drawing of a processor clock generator "clk." The processor clock generator provides clock circuitry that generates all the various clocks that are used by the processor.

FIGS. 7.0101AA–BB provide a circuit drawing of a processor clock controller "clkctl." The clock controller "clkctl" determines when the clocks are running. As described elsewhere, the processor is not always on. The clock controller uses enabling signals from wake up so that it knows when to turn on. Thus, some of the inputs to the clock controller are power wake up, receive wake up, timer wake up. The clock controller also synchronizes shut down of the clocks when the processor has completed its task.

FIGS. 7.0102AE–DJ provide a circuit drawing of a processor phase generator "clkph." The processor phase generator "clkph" generates master clocks—phase one "PH1" and phase two "PH2"—which are non-overlapping clocks.

FIGS. 7.0103AA–BD provide a circuit drawing of a clock state generator "clkst." The clock state generator "clkst" generates some derivative clocks. Processor instruction cycles are divided. There are cycles and there are states. Within each cycle, which is a certain time period, there are four states—S1 through S4. The states are all non-overlapping, and each state has a high time that is one quarter of the cycle time. As a processor instruction executes, the instruction is taken from the rom "rom," and loaded into the instruction register. The instruction can be, for example, a 1, 2 or 3 cycle instruction, depending on how complex the function is that is performed by that instruction. These are micro instructions for running the processor on chip. They should not be confused with the commands that are sent by radio frequency, which are a much higher level commands. The commands sent by radio frequency require many of these micro instructions for the processor to carry them out. During clock cycle one, line C1 in FIGS. 7.0103AA–BD is high, during clock cycle two, line C2 is high, etc. Within each one of those clock cycles, state one is high for a certain time period and then goes low, and state two goes high for a certain time period then goes low, and so on up through state four. Within each of these states, there is one phase one high time, and one phase two high time.

FIGS. 7.02AA–BF provide a circuit drawing of an address decoder "adrdec." In executing instructions, the processor has the need to move bytes of data between registers and ram "ram" and possibly to the serial IO controller "sio." The address decoder "adrdec" generates enable lines to those various different blocks (the registers, ram, and sio, as appropriate) when their address appears on the address bus. The primary input to the address decoder is the address bus. This decoder decides which circuit block is being addressed and issues an enable for either a write or a read, whichever is appropriate, to that particular block.

FIGS. 7.03AA–EH provide a circuit drawing of random access memory "ram." The ram has 512 bytes of storage available. 256 of those bytes are available to the user of the device 12, and the other 256 bites are used to do calculations required by the processor. Most of the drawing is taken up by blocks of RAM arrays "ram8×4."

FIGS. 7.0301AA–BB provide a circuit drawing of a ram control circuit "ramctl." The ram control circuit issues word line select enable signals, a read command, a write command, and some precharge signals. The ram control circuit generates the signals to control access to and from the random access memory "ram."

FIGS. 7.0302AA–AC provide a circuit drawing of a RAM array "ram 8×4." Each RAM array is made up of four rows and eight columns of RAM cells.

FIG. 7.030201 provides a circuit drawing of a single RAM cell. In the illustrated embodiment, the RAM cell is a six transistor RAM cell. Four transistor RAM cells are employed in alternative embodiments.

FIGS. 7.0303AA–AD provide a circuit drawing of a RAM precharge circuit "rampch." FIGS. 7.0304AA–AD provide a circuit drawing of a RAM precharge circuit "ramdch." In the illustrated embodiment, this dcircuit has been disabled as is shown in the figure. The RAM precharge circuits provides precharge signals to speed up writing to and reading from RAM cells.

FIG. 7.0305 provides a circuit drawing of a RAM address buffer "ramadb." The RAM address buffer isolates the capacitive load presented by the RAM circuits from the address bus.

FIGS. 7.0306AA–BA provide a circuit drawing of a RAM word line driver "ramwdr." The RAM wordline driver is a predecoder. It takes two address inputs and generates four possible select lines "P0–P3" which are used in a row decoder (discussed below) for the RAM.

FIGS. 7.0307AA–BB provide a circuit drawing of a RAM word line decoder “ramwdec.” The RAM word line decoder receives the select lines from the RAM wordline driver in conjunction with four other addresses “AD0–AD3” to select a unique word line. A word line is a row of RAM cells within the RAM.

FIGS. 7.0308AA–BB provide a circuit drawing of a RAM column select decode circuit “ramcdec.” The RAM column select decode circuit uses three address lines “AD5–AD7” to generate eight select lines “CSEL0–CSEL7.”

FIGS. 7.0309AA–BG provide a circuit drawing of a RAM column selector multiplexor “ramcsel.” The RAM column selector multiplexor uses the output select lines “CSEL0–CSEL7” from the RAM column select decode circuit “ramcdec” to connect one pair of bit or column lines out of eight pairs “BIT0N/P”–“BIT7N/P” onto a bus. The bus goes to a sense amp or to a write driver, depending on whether a RAM cell is being read or written. There are eight of these RAM column selectors side by side, functioning in the same manner. With any one selection, one of eight pairs are selected on FIGS. 7.0309AA–BG, but there are seven more similar selections taking place SO an entire byte of RAM is selected at one time.

FIGS. 7.0310AA–BB provide a circuit drawing of a RAM databus interface “ramdb.” The RAM databus interface includes a sense amp and write driver for the RAM. The RAM databus interface receives the output/input lines “BIT0N/P”–“BIT7N/P” from the RAM column selector “ramcsel.” Selected RAM cells can either be sensed or written.

FIGS. 7.04AA–HJ provide a circuit drawing of a ROM “rom.” The ROM has 4096 bytes of contact programmable memory. ROMs of multiple integrated circuits 16 are simultaneously mass programmed. In the third to the last mask step, each particular cell of ROM is programmed with a zero or a one. The ROM does not include the a information about the lot number, wafer number and die number discussed elsewhere herein. The ROM is programmed at the time of manufacture, whereas the information about the lot number and wafer number and die location is stored after the manufacture of the wafer using an electrically programmable or laser fuse programmable, or [el]ectrical fuse programmable structure.

FIGS. 7.0401AA–BB provide a circuit drawing of a ROM control logic circuit “romctl.” The ROM control logic circuit provides signals to allow the contents of eight memory cells of the ROM, one byte to be read out at a time.

FIGS. 7.0402AA–AB provide a circuit drawing of a ROM bit line precharge circuit “ROMPCH.” The ROM bit line precharge circuit precharges bit lines of the ROM. Bit lines are the vertical lines in the array of ROM cells on which the voltage that is sensed appears after selected ROM cells are accessed.

FIGS. 7.0403AA–BB provide a circuit drawing of a ROM word line driver “romwdr.” The ROM word line driver (or row driver) takes address inputs “A7–A9” and generates enable signals “WDR0–WDR7” to select row lines of the ROM.

FIGS. 7.0404AA–DC provide a circuit drawing of a ROM word block decoder “romwdec_rev.” The ROM word block decoder has as inputs the enable signals “WDR0–WDR7” from the ROM word line driver “romwdr” plus other addresses to generate actual word line signals themselves. A word line signal selects a row of ROM cells.

FIGS. 7.0405AA–BA provide a circuit drawing of a ROM bit line address driver “rombldr.” The ROM bit line address driver buffers some of the addresses so they are capable of driving a large decoder structure “rombldec” (described below).

FIGS. 7.0406AA–CK provide a circuit drawing of a ROM bit line decoder “rombldec.” The ROM bit line decoder provides a decoder structure for selecting a particular ROM bit line out of thirty-two bit lines. There are eight such “rombldec” circuits, allowing simultaneous selection of eight bit lines.

FIGS. 7.0407AA–AB provide a circuit drawing of a ROM sense amplifier “romsns.” The ROM sense amplifier is the sense amp used for determining the state of a particular ROM bit being accessed. Eight ROM bit sense amplifiers are used.

FIGS. 7.05AA–CB provide a circuit drawing of an instruction register “insreg.” The code or program that controls the operation of the processor is stored in the ROM. The instructions stored in the ROM are transferred one at a time to this instruction register “insreg” so that they can be interpreted and the processor can carry out the operations required by that instruction. After the integrated circuit wakes up, its operation is controlled by the wake up and clock recovery circuits. After the integrated circuit locks on to the clock and a valid start (Barker) code is received, the processor turns on and the program stored in the ROM takes over from that point. The program performs functions such as determining if the integrated circuit 16 is in a power up cycle. If the device 12 is in a power up cycle, the processor performs various tasks relevant to power up. If the integrated circuit 16 is receiving a command from an interrogator, the program will determine which command and then go through a sequence of required steps in order to respond appropriately to that command Then the program allows the integrated circuit 16 to go back to sleep.

FIGS. 7.0501AA–BB provide a circuit drawing of an instruction register “insrcel” included in the instruction register “insreg.” FIGS. 7.06AA–CN provide a circuit drawing of an instruction decoder PLA “insdec.” The instruction decoder PLA interprets what is in the instruction register “insreg” and issues all the enable signals necessary to effect performance of the functions called for in that instruction. Details of the instruction decoder PLA are shown in FIGS. 7.0601AA–HI; 7.0602AA–JH; 7.0603AA–JI; and 7.0604AA–JI.

FIGS. 7.0601AA–HI provide a circuit drawing of an instruction decoder (first section) “insdec1.”

FIGS. 7.0602AA–JH provide a circuit drawing of an instruction decoder (second section) “insdec2.”

FIGS. 70603AA–JI provide a circuit drawing of an instruction decoder (third section) “insdec3.”

FIGS. 7.0604AA–JI provide a circuit drawing of an instruction decoder (fourth section) “insdec4.” FIG. 7.060401 provides a circuit drawing of an instruction decoder ROM amp “insramp” included in the circuit of FIGS. 7.0604AA–JI, 7.0601AA–HI, 7.0602AA–JH, and 7.0603AA–JI.

FIG. 7.060402 is a circuit drawing of an instruction decoder PLA amp “inspamp” included in the circuit of FIGS. 7.0604AA–JI, 7.0601AA–HI, 7.0602AA–JH, and 7.0603AA–JI. FIG. 7.060403 is a circuit drawing of an instruction decoder PLA latch “insplat” included in the circuit of FIGS. 7.0604AA–JI, 7.0601AA–HI, 7.0602AA–JH, and 7.0603AA–JI.

FIGS. 7.07AA–BB provide a circuit drawing of a conditional qualifier decoder “cqualdec.” Certain instructions behave differently depending on certain conditions (e.g., whether a carry bit is set), and the conditional qualifier decoder looks for these conditions.

FIGS. 7.08AA–CA provide a circuit drawing of a databus latch and precharge circuit “dblatch.” Data is bused around in eight bit bytes, and the databus latch and precharge circuit drives the databus. The data bus is in a precharge high state when the data bus is not being used. Whichever source of data is selected to put its information on the bus will then drive selected bits low if appropriate.

FIGS. 7.09AA–BF provide a circuit drawing of an arithmetic logic unit "alu." The arithmetic logic unit "alu" is a basic arithmetic logic unit that provides enough flexibility to perform the functions that are needed for the RFID task. Details of the arithmetic logic unit are provided in drawings below.

FIGS. 7.0901AA–CE provide a circuit drawing of an ALU low byte "alubytl". There are eight bits within the ALU low byte that are all processed simultaneously.

FIGS. 7.090101AA–AD provide a circuit drawing of a ALU bit "alubitl" included in the ALU low byte "alubytl." FIGS. 7.090101AA–AD show the registers contained within each bit of the ALU. The registers include an A cell "aluacell" and a B cell "alubcell" which are the primary registers. The data on which arithmetic or logical operations are to be performed reside typically in the A cell "aluacell" or the B cell "alubcell." The registers further include a program counter "alupc," a stack pointer "alurcell," a data pointer "alurcell," and a memory address register "alumar" that provides for indirect addressing. The ALU bit "alubitl" further includes an adder "aluadd" and a slave register "aluslave" to the adder.

FIG. 7.09010101 is a circuit drawing showing details of construction of an ALU bit decoder cell "alubdec" included in the ALU bit.

FIG. 7.09010102 is a circuit drawing showing details of construction of the ALU B register cell "alubcell" included in the ALU bit.

FIG. 7.09010103 is a circuit drawing showing details of construction of the ALU A register cell "alubacell" included in the ALU bit.

FIG. 7.09010104 is a circuit drawing showing details of construction of the ALU program counter "alupc" included in the ALU bit.

FIG. 7.09010105 is a circuit drawing showing details of construction of the ALU register cell "alurcell." Such cells are used for a stack pointer, data pointer, etc.

FIG. 7.09010106 is a circuit drawing showing details of construction of the ALU memory address register "alumar" included in the ALU bit.

FIG. 7.09010107 is a circuit drawing showing details of construction of the ALU slave cell "aluslave" for the ALU adder "aluadd."

FIG. 7.09010108 is a circuit drawing showing details of construction of the ALU adder "aluadd" included in the ALU bit.

FIGS. 7.0902AA–BD provide a circuit drawing for an ALU high byte "alubyth" which functions similarly to the ALU low byte "alubytl." Two ALU bytes are provided so that sixteen bit commands can be processed.

FIGS. 7.090201AA–AC provide a circuit drawing of a bit "alubith" included in the ALU high byte "alubyth."

Details of Low Power Dormant Mode

It is sometimes desirable to prevent the integrated circuit 16 from responding to commands from an interrogator. For example, after communication with a particular device 12, it is sometimes desirable to prevent that particular device 12 from responding to a subsequent interrogation that is intended for a different device 12. If, for example, the device 12 is used in connection with an access gate, after an interrogator has read a badge containing the device 12 as a controlled access point is passed, the interrogator no longer has a need to communicate with that badge. The interrogator instead would want to pick up subsequent badges passing through the access gate. In addition, when the interrogator no longer has a need to communicate with a particular device 12, it is desirable that the device 12 stay in the sleep mode to conserve battery power.

In one embodiment, the device 12 is put into an unresponsive state by using a counter which is set to a desired time via a radio frequency command. The device will then not respond to Identify commands (described below in greater detail) used by an interrogator to request information from a device 12. In this embodiment, the unresponsive state can be cancelled by a radio frequency command. However, this embodiment is disadvantageous in that the device must wake up to process incoming commands and abort if the command is an Identify command. This consumes battery capacity.

In a preferred embodiment, the device 12 can be placed in a dormant mode via a radio frequency command. The dormant mode cannot be cancelled. When in the dormant mode, the device 12 does not wake up to look for incoming commands.

FIGS. 7.10AA–CC provide a circuit drawing of a timed lock out divider "tld." The timed lock out divider takes as an input the low power clock which is the same clock that sets the wake up interval for the integrated circuit 16. The timed lock out divider provides two functions. The timed lockout divider provides an alarm timer function, and provides a timed lockout function which is used for the dormant mode function and for the timed lockout of Identify commands.

The alarm timer is set to go off in intervals, such as about every one minute. As an alarm timer, the timed lock out divider causes the integrated circuit 16 to wake up and check for threshold violations in alarm mode. Such threshold violations would be triggered by analog sensors such as temperature sensors, magnetic sensors, etc.

The timed lock out divider also allows, by RF command from an interrogator, a user to disable a device 12 to make it not respond for a prescribed period of time (i.e., allows the user to place the device 12 in the dormant mode). The prescribed period of time can be set in various increments. For example, in the illustrated embodiment, the increments are one second increments from one up to 255 seconds.

When in the dormant mode, the device 12 does not periodically switch to the receiver on mode to check for the presence of radio frequency commands. Therefore, power is conserved.

This dormant mode function is useful for the same reasons that the cancellable timed disabling is useful. If, for example, the device 12 is used in connection with an access gate, after an interrogator has read a badge containing the device 12 as a controlled access point is passed, the interrogator no longer has a need to communicate with that badge. The interrogator instead would want to pick up subsequent badges. Therefore, the interrogator can instruct the device 12 to not respond for a certain time, so as to prevent an unwanted response of a device 12, after having communicated with that device 12, but with increased power savings over the cancellable timed disabling. Because wake ups are disabled, current consumed by the device 12 is very low; e.g., 1 $\mu$A.

FIG. 7.1001 provides a circuit drawing showing details of construction of a timed lock out divider cell "tldcel" included in the timed lockout divider "tld."

FIGS. 7.11AA–AB provide a circuit drawing of a timed lock out register "tloreg." This register acts as a down counter and is selectively set with the desired lockout time, from 1 to 255 seconds.

FIGS. 7.1101AA–AC provide a circuit drawing of a timed lock out register cell "tlorcerl included in the timed lockout register.

FIGS. 7.12AA–AC provide a circuit drawing of an read/write control register or output register "oreg." There are a number of these output registers. The output registers allow the processor to send control signals out to various peripheral circuits to cause them to function when required.

FIG. 7.1201 provides construction details of a control register cell "regcell" included in the output register "oreg."

FIGS. 7.13AA–BA provide a circuit drawing of a status register "sreg." The processor uses the status register to monitor the status of lines supplied from various blocks of circuitry.

FIGS. 7.1301AA–AB provide a circuit drawing of a status register cell "sregcel" included in the status register.

FIGS. 7.14AA–AB provide a circuit drawing of a serial input output block "sio." The serial input output circuitry is the data path for data received and for the data to be transmitted. This circuit controls the transfer of the serial stream of data received from the receiver into the processor. The circuit also controls the transfer of the transmit serial data stream from the processor out to the transmitter. The serial input output circuitry comprises two blocks: a block "siodata" that processes data, and a controller "sioctl" that runs the block that processes data.

FIGS. 7.1401AA–AB provide a circuit drawing of a serial input output data path "siodata." When the integrated circuit 16 is in a transmit mode, data enters the bit registers "sioreg" from the top of the figure, and the data is transferred down to the registers "siobdlat" and "siobdlat_inv" which are the row of blocks second up from the bottom of the figure. The intermediate stages "sioxor" are all exclusive or gates that are used to generate check bits according to the previously mentioned modified Hamming code. The extra five bits "P0–P4" appended to the eight data bits "D0–D7" are generated by the exclusive-or gates, and then all thirteen bits are transferred to the registers "sioshr" which are the row of blocks at the bottom of the figure. The thirteen bits are serially shifted out to the right of the figure.

When the integrated circuit 16 is in a receive mode, a reverse sequence takes place. Data is shifted into the thirteen bit registers "sioshr" shown on the bottom of the figure, then transferred up to the registers "siodblat" immediately above the shift registers "sioshr" in the figure. Then the exclusive or circuitry "sioxor" uses the data and the check bits to determine whether there are any errors. If there are any correctable errors, they are corrected at that point. The serial input output data path "siodata" can also detect double bit errors which are not correctable. If a double bit error is detected, a signal is provided at the upper left of the figure to the processor that an uncorrectable error has occurred. Assuming that there is no uncorrectable error, the eight corrected bits are now present as inputs to the top row of registers "sioreg." The eight corrected bits are then transferred in to the top row of registers. From the top row of registers "sioreg," the corrected bits are transferred in parallel to the processor.

FIGS. 7.140101AA–AB provide construction details of the serial input output register cell "sioreg" included in the serial input output data path "siodata."

FIGS. 7.140102AA–GF provide construction details of the serial input output exclusive or circuit "sioxor" included in the serial input output data path "siodata."

FIGS. 7.140103AA–AB provide construction details of the bidirectional latch "siobdlat_inv" included in the serial input output data path "siodata."

FIGS. 7.140104AA–BB provide construction details of the shift register "sioshr" included in the serial input output data path "siodata."

FIGS. 7.140105AA–AB provide construction details of the bidirectional latch "siobdlat" included in the serial input output data path "siodata."

FIGS. 7.1402BA–EI provide a circuit drawing of the previously mentioned control logic "sioctl." The control logic "sioctl" generates all the clocking and the signals that control when data is transferred from register to register.

FIGS. 7.140201AA–BB provide a circuit drawing showing construction details of the counter bit "siocbit" included in the control logic "sioctl."

FIGS. 7.15AA–EC provide a circuit drawing of a data interleaver "dil." In a number of modulation schemes used or selectively used by the integrated circuit 16, differential encoding is employed. Use of differential encoding in the integrated circuit 16 makes possible a simpler receiver in the interrogator. However, if an error occurs in the process of differential encoding, it necessarily corrupts two adjacent bits. The modified Hamming code cannot correct errors where two adjacent bits are in error. This problem is solved by interleaving two bytes. Bit by bit, the first bit of one byte is shuffled next to the first bit of another byte and so on through all thirteen bits. This way, when differential encoding is performed, which may possibly create two adjacent errors, the two bytes are deinterleaved and separated at the receiver so that the bytes are in separate error corrective words. The errors can then be fixed.

The data interleaver works by shifting data in from a data input "SIOTXD" (on the upper left of FIGS. 7.15AA–EC). Twenty-six bits are shifted into the registers "dil_sreg" shown along the top of FIGS. 7.15AA–EC, then all twenty-six bits are simultaneously shifted to the lower registers "dil_plsreg" and scrambled in order simultaneously by ; 0 wiring interconnections between the registers "dil_sreg" and the registers "dil_plsreg" shown in FIGS. 7.15AA–CC. Thus, a new interleave order is generated on transfer from the registers "dil_sreg" to the registers "dil_plsreg." Then, the contents of the registers "dil_lsreg" are shifted out (to the right in the view of FIGS. 7.15AA–EC) in a serial, bit by bit fashion, through line "DILTXD."

FIGS. 7.1501AA–CA provide a circuit drawing showing construction details of the shift register "dil_sreg" included in the data interleaver FIGS. 7.1502AA–CA provide a circuit drawing showing construction details of the parallel load shift register "dil_plsreg" included in the data interleaver "dil."

FIG. 7.150201 provides a circuit drawing showing construction details of a shift register bit "dil_sregbit" included in the parallel load shift register "dil_sregbit" and in the shift register "dil_sreg."

FIGS. 7.16AA–CD provide a circuit drawing of a convolutional encoder "conv." In the illustrated embodiment, convolutional encoding is disabled. However, in one embodiment, convolution encoding is provided. The circuitry of FIGS. 7.16AA–CD performs more functions than just convolutional encoding. The circuitry of FIGS. 7.16AA–CD also includes a preamble generator. In one embodiment, a series of zeros are generated as a preamble. However, in the illustrated embodiment, a pattern of alternating zeros and ones (0101) is generated for DPSK backscatter. The circuitry of FIGS. 7.16AA–CD also includes a clock for the SIO "sio."

FIG. 7.1601 provides a circuit drawing showing construction details of a shift register cell "convshr" included in the convolutional encoder "conv."

FIG. 7.1602 provides a circuit drawing showing construction details of a summer "convsum" included in the convolutional encoder "conv."

FIGS. 7.17AA–BB provide a circuit drawing of a shift register data multiplexor "shdcel." The shift register data multiplexor provides a port into the processor. It does a selection among eight sources on the integrated circuit 16, and connects only one of them for shifting of data for transfer into the A register.

FIGS. 7.18AA–CC provide a circuit drawing of a digital port output controller "doutport." The device selectively reads data via a digital port in response to a radio frequency command, instead of by radio frequency reception, and the device selectively writes data via a digital port in response to a radio frequency command, instead of by radio frequency. The digital port output controller circuit controls these functions. The digital port output controller circuit also includes a clock in order to synchronize the transfer of the data in either direction (input or output).

The RF processor "rfproc" shown in FIGS. 6AA–EK contains the receiver 30, the transmitter 32, the clock recovery and data recovery a circuit 38, and the wake up timer and logic circuit 36. The RF processor "rfproc" is shown in greater detail in FIGS. 8AA–CB.

Figure 8A:
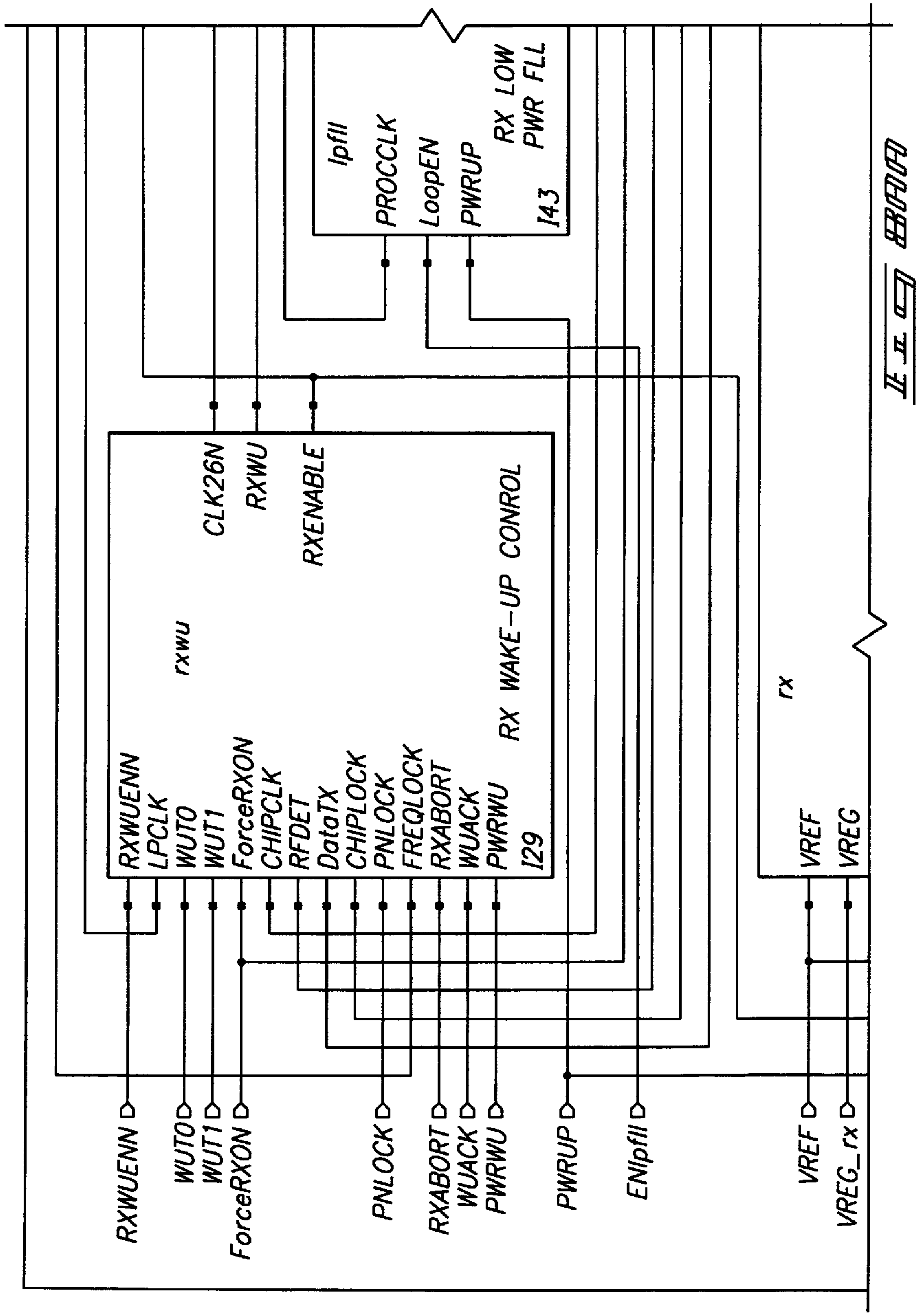
Figure 8A:
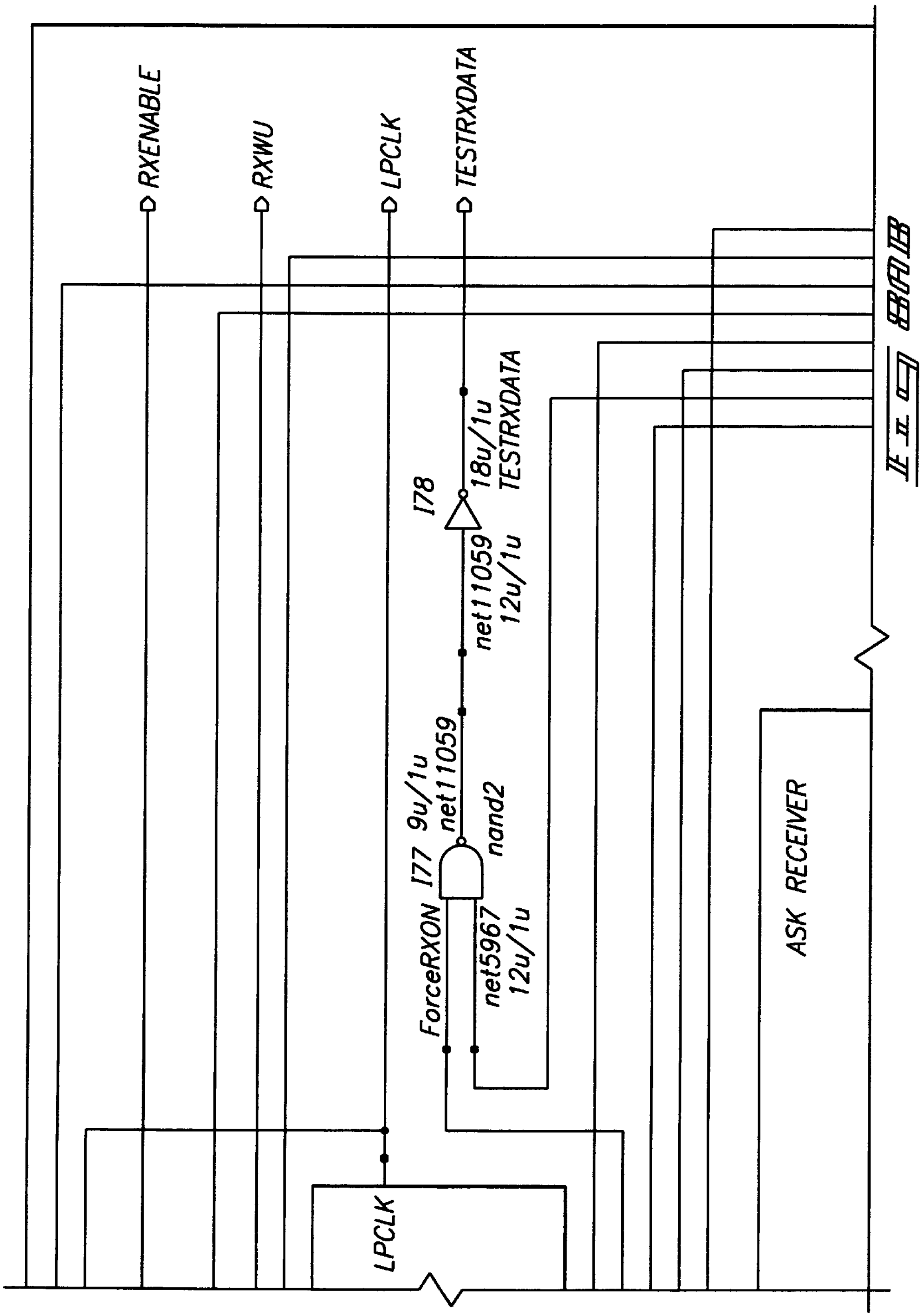
Figure 88A:
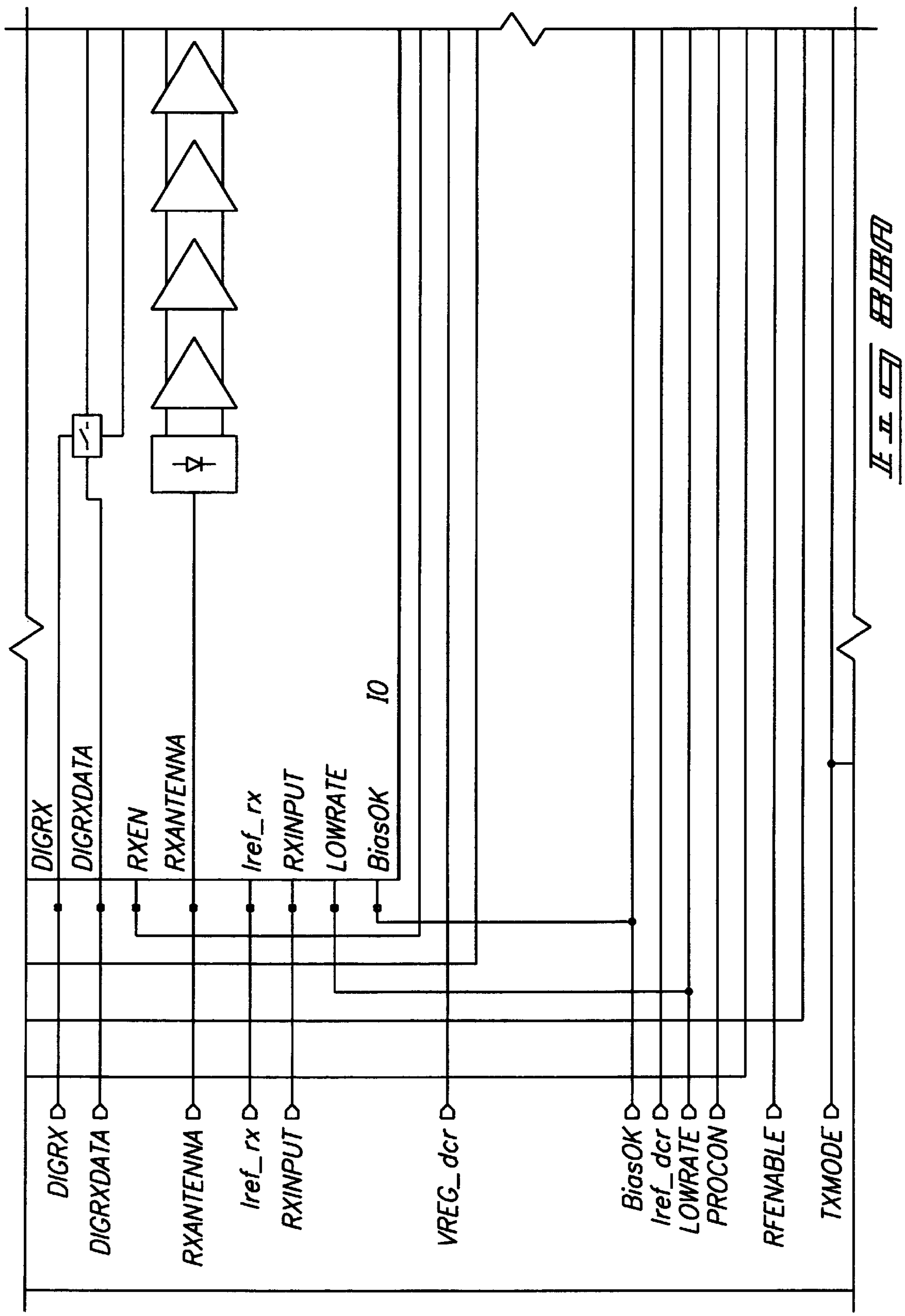
Figure 8B:
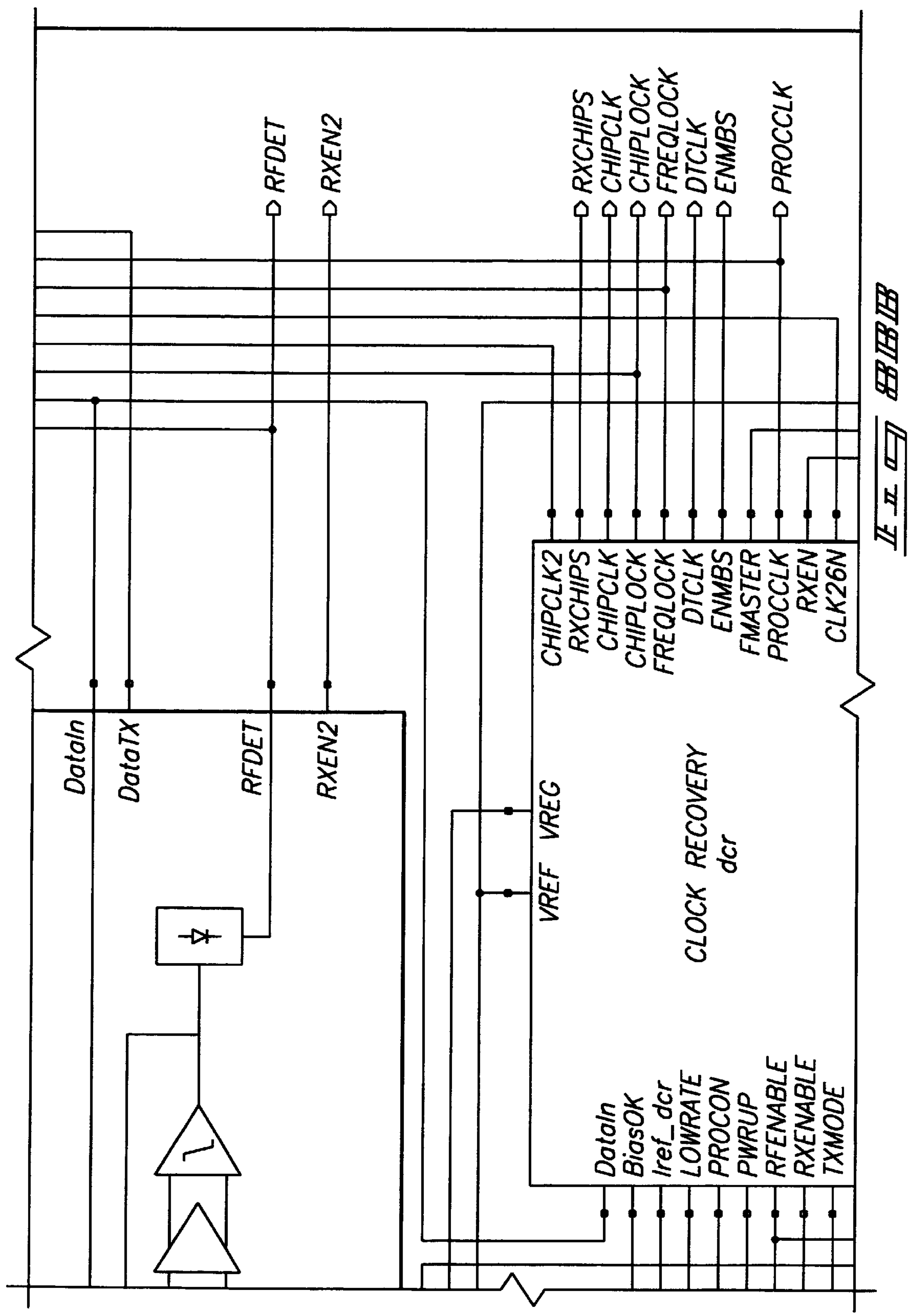
Figure 8C:
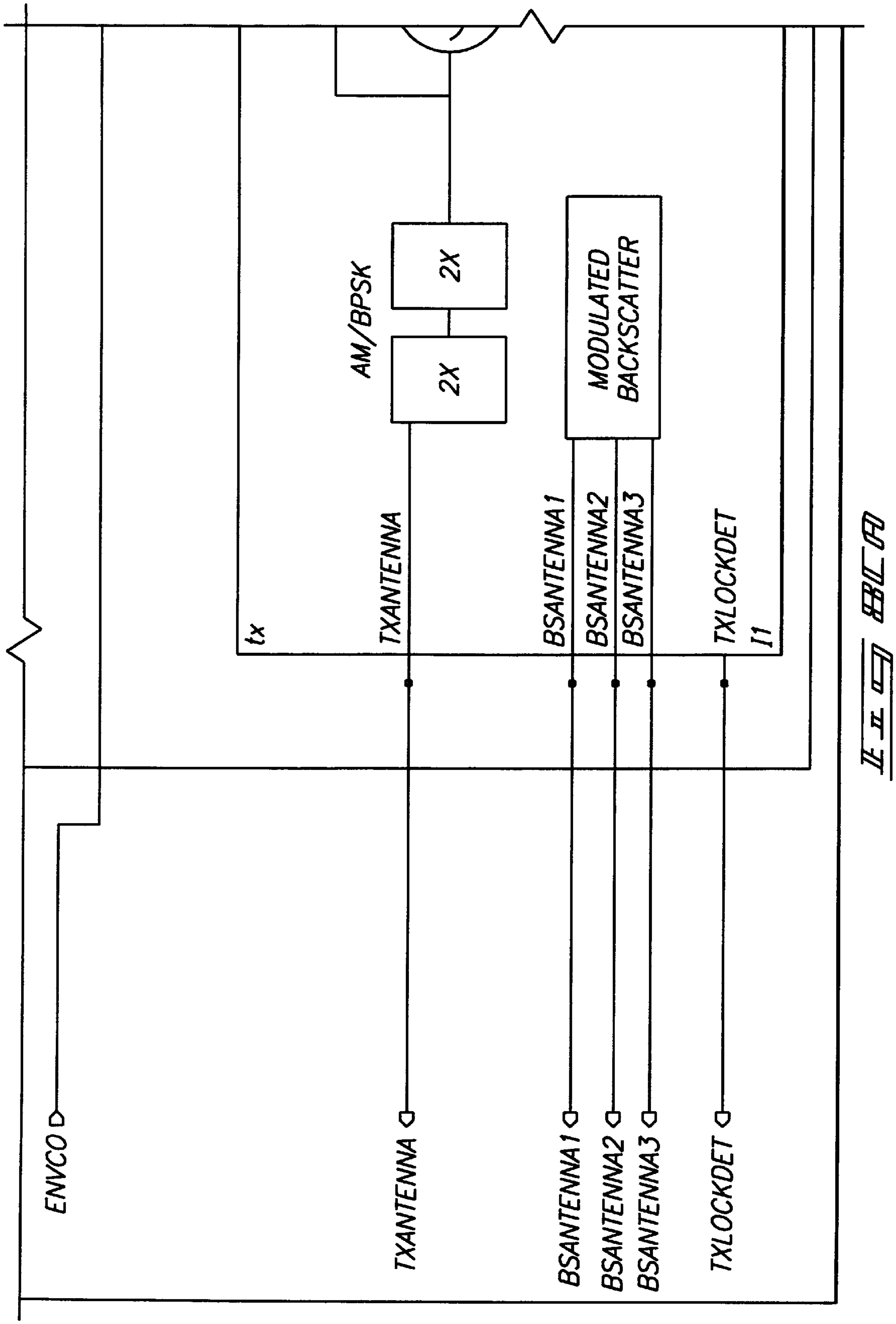
Figure 8C:
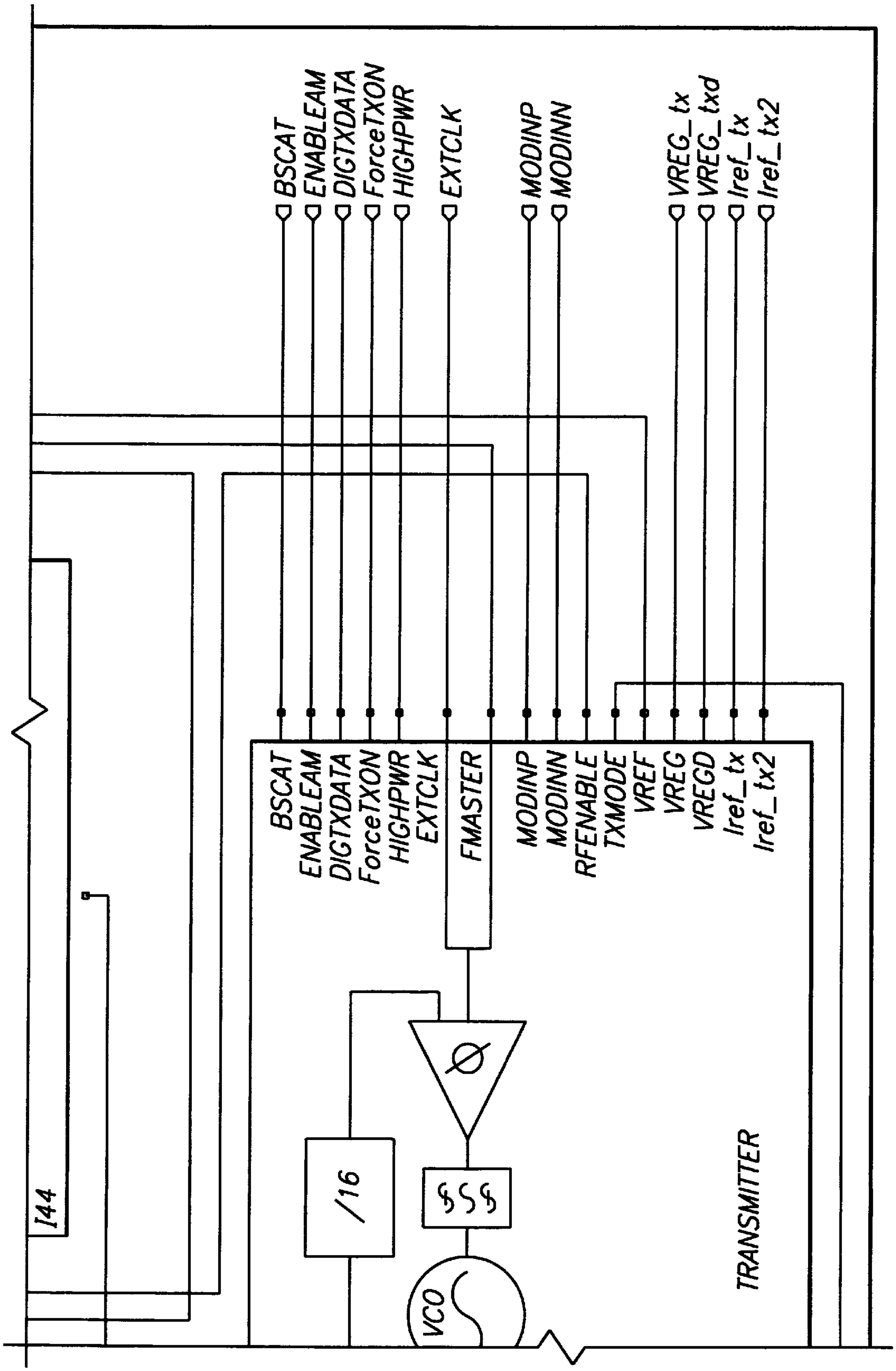

FIGS. 8AA–CB provide a circuit drawing of a RF processor rfproc." The RF processor "rfproc" includes a receiver "rx" (which is the receiver 30 of FIGS. 6AA–EK), a transmitter "tx" (which is the transmitter 32 of FIGS. 6AA–EK), a low power frequency locked loop "lpfll," a counter bit "Ipfll_cbit," a receiver wake up controller "rxwu" (which is the wake up timer and logic circuit 36 of FIGS. 6AA–EK), and a digital clock and data recovery circuit Ndcr" (which is the clock and data recovery circuit 38 of FIGS. 6AA–EK). Thus, RF processor "rfproc" se includes the clock that sets the wake up interval, as well as logic that performs tests on the incoming signal to see whether the incoming signal is a valid signal such that the integrated circuit 16 should stay awake.

FIGS. 8.01AA–DE provide a circuit drawing of the receiver "rx" included in the RF processor. In the illustrated embodiment, the receiver "rx" includes a Schottky diode detector "diodedet." In the illustrated embodiment, the Schottky diode detector "diodet" is an inductorless Schottky diode detector. Instead of employing inductors in the diode detector to supply bias current to the diode, the diode detector includes a current source which drives current through both an antenna and a Schottky diode included in the detector. The inductorless Schottky diode detector is described in more detail below. FIGS. 8.01AA–DE also illustrate a CMOS detector "cmosdet" that is used in accordance with an alternative embodiment, but which is not used in the illustrated embodiment. The output of the Schottky diode detector is applied through a series of AC coupled amplifiers. More particularly, in the illustrated embodiment, the Schottky diode detector is applied through amplifiers "videoamp1," "videoamp2" replicated four times, and then into a comparator. The function of the comparator is to put out a full digital signal. The output of the comparator is a base band digital representation of the command that was sent by the interrogator.

A base band signal is a signal without a carrier frequency present. The output of the comparator is a signal that is the equivalent of the signal that was used to modulate the carrier back at the interrogator.

The receiver "rx" includes a RF detect circuit "rxdetect." The RF detect circuit determines when a modulated radio frequency signal is present at the receiver and the output of the receiver is switching between high and low states. The receiver "rx" includes a bias block ccrxbias" that provides currents to the various amplifiers "videoamp1," "videoamp2," etc. The receiver "rx" further includes logic that bypasses the receiver when a user selects not to use RF for an input, but rather to provide a base band input signal directly in digital form. The user may make the selection to bypass the receiver, for example, for testing or exercising the integrated circuit 16. The user may also make the selection in applications where the receiver portion of the chip is not required, but the integrated circuit 16 is used to transmit information (e.g., for periodic transmissions).

Schottky Diode RFID Detector

Overview

For purposes of realizing a cost effective and low power radio frequency receiver on an RFID tag, a simple Schottky diode receiver is utilized. The receiver is formed from a Schottky diode detector, an amplifier, and the receiving antenna "rxantenna". With the implementation of a single integrated circuit 16 RFID tag, an easy and low cost technique for configuring the frequency of operation on a tag is needed. Receiver frequency characteristics can be tailored by selecting an appropriately sized antenna to be coupled to the integrated circuit 16 that supports the Schottky diode detector. Furthermore, adjustment of bias current across the Schottky diode can be used to realize a desired resistance there across, enabling tuning or detuning of the receiver.

For purposes of enabling simplified representation, FIG. 29 illustrates a simplified circuit schematic for one embodiment of a receiver 80 having a Schottky diode detector 84 and antenna 44.

The detector 84 includes a Schottky diode 86 having an anode connected to the antenna 44 and having a cathode.

The exemplary antenna 44 is formed from a loop or folded dipole construction. The antenna 44 performs band pass filtering.

The detector 84 further includes an ideal current source 88 connected to the cathode of the Schottky diode 86 and driving current through the antenna and Schottky diode 86 in the direction from the anode to the cathode. The current source 88 is an ideal current source, and is configured to forward bias the Schottky diode 86, realizing a desired resistance (or impedance) in the process.

The detector 84 further includes a capacitor 90 connected between the cathode of the Schottky diode 86 and ground. The capacitor 90 provides a radio frequency short to ground so that all radio frequency voltage appears across the Schottky diode 86. This maximizes a base band signal produced by the Schottky diode 86.

The detector 84 further includes a capacitor 92 having a first terminal connected to the cathode and having a second terminal defining an output of the detector 84. The capacitor 92 provides an AC short to video frequency, and defines the output of the detector 84. The capacitor 92 allows different bias levels in the detector and at the input of a video amplifier connected to the output of the detector 84. Details of the actual circuit implementation on integrated circuit 16 (of FIG. 5) will be discussed below with reference to FIGS. 5, 8AA–CB, 8.01AA–DE, 8.0101AA–CB, 28, 29, and 30.

Antenna Implementation

Preferably, the antenna "rxantenna" is constructed and arranged to form a folded dipole antenna, consisting of a continuous conductive path, or loop of microstrip. The terminal ends of the antenna 44 loop each form a conductive lead that electrically interconnects with the integrated circuit 16 of FIG. 5. According to the actual circuit layout of FIG. 6, antenna "rxantenna" is connected to the integrated circuit 16 via the exposed conductive bonding pad labeled "rxantenna—Pad D". Alternatively, the antenna can be constructed as a continuous loop antenna. In this case, the antenna is constructed from a continuous piece of conductive microstrip configured in the shape of a square or circle to form a loop antenna.

In assembly, antenna 44 (as well as antenna 46) is depicted in electrically conductive and bonded relationship with "rxantenna—Pad D," shown on the integrated circuit 16 of FIG. 6. Similarly, antenna 46 is bonded to "txantenna—Pad AA". The preferred assembly technique, discussed below, involves a flip-chip epoxy bonding technique wherein the antennas 44 and 46 of FIG. 5 are actually printed onto the back face of the plastic card or carrier (e.g. card 11 of FIG. 2 and stamp 20 of FIG. 3), after which the integrated circuit 16 is bonded to the antenna, as well as to the battery, using a conductive epoxy.

Preferably, the antennas 44 and 46 are printed onto the back side of the card or stamp, forming each microstrip loop antenna thereon. For example, the antenna can be silk screened onto the card with a conductive polymer thick film. Alternatively, a conductive silver filled epoxy can be used. Alternatively, the antenna can be formed from a separate piece of conductive material, for example, from a piece of wire or conductive ribbon that is glued to the back of the card.

One exemplary technique for assembling the postage stamp 20 of FIG. 4 is provided here below. The same technique can be used to assemble the badge 10 of FIG. 2, or any other similarly constructed tag having a rigid support or substrate similar to plastic cards 11 and 21. First, antennas 44 and 46 (of FIG. 5) are mounted to a back face of the card. Preferably, the above elements are simultaneously printed onto the back of a large sheet of plastic with a conductive silver printed thick film, after which the cards are individually separated, or cut from the sheet. Pads on the integrated circuit 16 form enlarged connection points for electrically bonding each antenna 44 and 46 to "rxantenna—Pad D" and "txantenna—Pad AA" of FIG. 6 and for connections to a power supply. Next, the card is positioned front face down onto a rigid support plate. Then integrated circuit 16 (of FIG. 4) is mounted to the pads with conductive beads of epoxy. Finally, the battery 18 is bonded along its bottom face with a bead of conductive epoxy, after which conductive epoxy is used to electrically connect the opposite terminal or top of the battery with a corresponding conductive die pad.

Subsequently, a metal dam sized to conform generally to the outer peripheral shape of the card 20 is placed over the back of the card. The dam functions as an outer template while a thin layer of nonconductive epoxy (not shown) is applied to the back of the card 20, preferably hermetically sealing in the integrated circuit 16, antenna and battery. Preferably, the thin coat of epoxy consists of a coating, barely thick enough to cover over the components forming the device. One benefit provided by this construction technique is the elimination of any visible bumps in the tag which can result when constructing the tag by heat sealing two or more pieces of plastic card together to trap the device 12 therein. However, a lesser preferred construction of this invention envisions forming the tag, e.g. badge 10, stamp 20, or some other tag, with such a heat sealed sandwich of plastic cards.

Preferably, the above technique for mounting integrated circuit 16 to card 20 (of FIG. 4) consists of a flip-chip mounting technique. One example of a flip-chip mounting technique is disclosed in pending U.S. patent application Ser. No. 08/166,747, "Process of Manufacturing an Electrical Bonding Interconnect Having a Metal Bond Pad Portion and Having a Conductive Epoxy Portion Comprising an Oxide Reducing Agent," listing Rick Lake and Mark E. Tuttle as inventors now U.S. Pat. No. 5,480,834, and incorporated herein by reference.

Integrated Circuit Implementation

According to FIG. 8, the Schottky diode detector "diodet" is configured within receiver "rx" to receive radio frequency signals via receiving antenna "rxantenna". One exemplary receiving antenna configuration is depicted in FIG. 5, denoted generally by reference numeral 44. In operation, the Schottky diode detector and the receiving antenna cooperate to form a tunable receiving circuit. Signals detected by the Schottky diode detector are input to a five stage amplifier, then a comparator, for further signal conditioning. The output of the comparator is a digital representation of the received baseband signal.

As shown in FIG. 8, receiver "rx" is an Amplitude Shift Keying (ASK) receiver. This is also known as an AM receiver. The illustrated embodiment employs On Off keying (OOK) wherein a digital one ("1") is represented by the presence of the RF carrier, and wherein a digital zero ("0") is represented by the absence of the carrier.

FIGS. 8.01AA–DE illustrate in greater detail the circuit implementation of receiver "rx". According to this embodiment, Schottky diode detector "diodedet" receives input signals via an input "rxantenna," and bias voltages for the current source via a pair of inputs "bias1" and "bias2". A pair of output signals "OUTN" and "OUTP" leave "diodedet" for input to a serially connected chain of amplifiers, and a comparator. The array of amplifiers comprise five video amplifiers, labeled "videoamp1" and "videoamp2". Bias voltages are applied to "bias1" and "bias2" via "rxbias," a bias circuit which generates all bias voltages required by the receiver.

A circuit "rxdet" shown in FIGS. 8.01AA–DE receives the output signal from the comparator, via combinational logic, with "digrxdata" and "digrx". The output signal "RFDET" is driven high if there is a signal at the output of the comparator. The resulting signal input into "rxdet" is received via "dataIn." Additional inputs to "rxdet" include "lowrate," "Vref," "Vbias1," "Vbias2," "Vreg," and "enable." Further details of "rxdet" are disclosed below with reference to FIGS. 8.0106AA–CD, entitled "RF Detect".

FIGS. 8.0101AA–CB illustrate one embodiment for realizing the Schottky diode detector "diodedet" of FIGS. 8.01AA–DE. Namely, a Schottky diode is forward biased from receiving antenna, coupled at "ANT," to a detector output "OUTP." A second Schottky diode is forward biased from Vdd to a detector output "OUTN." Two current sources are formed by four transistors, and are driven by bias voltages at "bias1" and "bias2." A capacitor is coupled to Vss, between each Schottky diode and associated output, "OUTP" and "OUTN," respectively. Furthermore, an array of parallel capacitors are provided in series between each Schottky diode and associated output, "OUTP" and "OUTN," respectively. The array of parallel capacitors acts as a single capacitor. Each Schottky diode is formed from an array of Schottky diodes. In order to use standard contact hole sizes, each Schottky diode is formed from an array of Schottky diodes connected together in parallel to act as a single Schottky diode.

According to FIGS. 8.01AA–DE, "OUTP" and "OUTN" are input into a multiple (e.g., five) stage amplifier and into a comparator. In order to avoid amplification of substrate noise, a differential amplifier is employed for each stage of the multiple stage amplifier. Noise appears equally on both inputs of each differential amplifier, and, the common mode rejection of the differential amplifiers impedes transmission of substrate noise. The differential amplifiers amplify a received baseband signal up to a digital level. A dummy Schottky diode (the lower Schottky diode in the figures) is connected to the second input of the first differential amplifier.

Details of Realization of Wide Carrier Frequency Bandwidth

In order to meet the wide range of intended applications, it is desirable to construct the integrated circuit for an RFID tag to realize operation of a wide range of carrier frequencies. For example, several desirable carrier frequencies for the device disclosed in FIGS. 5 and 6 are 915, 2450, and 5800 MegaHertz bands. Frequency selectivity is realized in the device of FIGS. 5 and 6 by appropriately configuring external antennas and internal circuit components of the integrated circuit. For the case of a single integrated circuit with an active on-board transmitter, it is necessary to design circuit components into the integrated circuitry prior to mounting and encapsulation of the integrated circuit with an antenna inside of a package. Hence, the circuit components needed to facilitate tailoring of the carrier frequency must be "designed in" the integrated circuit. In the case of a backscatter transmitter, components included in the integrated circuit can be selected so as to allow operation over a wide range of carrier frequencies, the selection being made by choice of antenna.

According to FIGS. 8.01AA–DE, the number of amplifiers that need to be implemented via "videoamp1" and "videoamp2" is determined based upon the magnitude of the minimum detected signal and the required signal to noise (S/N) ratio. Amplification is sufficient to produce full digital levels at the output of the comparator.

The capacitor configured to ground in the video receiver circuit of FIG. 29 (and FIGS. 8.0101AA–CB) is used to separate the radio frequency (RF) from the "VIDEO AMP" side of the video receiver circuit. The capacitor is sized to impart an effective short circuit to ground at radio frequency, thereby ensuring that all of the radio frequency (RF) voltage appears across the Schottky diode terminals. Additionally, the capacitor should be sized small enough at video frequencies, so that the capacitor does not load down the video amp circuit.

The capacitor configured in series in the video receiver circuit of FIG. 29 (and FIGS. 8.0101AA–CB) is used to block out the DC component of a voltage to "VIDEO AMP" while retaining the AC component. In this manner, the series capacitor forms a "blocking" capacitor or "coupling" capacitor.

Details of Inductorless RF Detector

A second desirable feature for the integrated circuit of an RFID tag is to eliminate the need to use inductors when constructing the Schottky diode detector. One technique for providing a bias current to a Schottky diode is disclosed in FIG. 28. FIG. 28 illustrates a receiver 60 including an antenna 62 and a Schottky diode detector 64. The receiver 60 includes inductors 68 and 70 used to provide the bias current via voltage source 74 with this implementation. A capacitor 76 is shunted to ground, and a second capacitor 78 is placed in series, providing AC coupling to the video amplifier. Several variations of such inductor-based bias current implementations are described in a paper entitled "Designing Detectors for RF/ID Tags," by Raymond W. Waugh of Hewlett-Packard Company, submitted for presentation at the RF Expo, San Diego, Feb. 1, 1995, and which is already incorporated by reference. Inductors are required in all of these constructions, but their implementation on an integrated circuit proves difficult because of problems inherent in forming inductors in an integrated circuit. The circuit in FIG. 29 eliminates the inductors by biasing the Schottky diode with a high impedance current source. A current sink is provided by connecting the far end of the antenna to Vdd.

Details of Elimination of Overdrive Problem

The Schottky diode detector circuit implementation of FIGS. 8.0101AA–CB realizes a technique for negating the effect of high power radio frequency (RF) input levels on the Schottky diode detector. More particularly, when high level radio frequency (RF) power is present at the antenna "rxantenna," e.g. when the RFID tag antenna is close to the transmitting antenna of an interrogator, the signal present on node "A" of FIG. 29 becomes large. For example, the signal on node "A" could be several hundreds of millivolts. The rising and falling edges of the detected signal are controlled by two separate time constants which are very different, as shown in FIG. 31. As shown by the high power signal of FIG. 31, the high power signal has a rising edge which is fast, or has a very steep, nearly vertical slope. The nearly vertical slope of the rising edge results because the rising edge is controlled by the effective resistance of the Schottky diode (about 1 kOhm) multiplied by the capacitance of capacitor 90 (Crf) (about 1–10 pF). Hence, the resulting time constant is about 1 to 10 nanoseconds.

In contrast, the falling edge of the detected signal in FIG. 31 is controlled by the current source 88 as it discharges capacitor 90 (Crf), which takes approximately 100 nanoseconds. As a result, the voltage waveform at node "A" is distorted. According to the amplified digital version of the signal, shown in FIG. 31, the signal in the high power case is distorted by the unequal rise and fall times. The onset of each fall for the digital version is triggered at the cross-over point, which deviates substantially from that of the low power signal. Such a distortion poses a serious problem for implementing clock recovery schemes, which rely on accurate edge-to-edge timing.

To overcome the above-mentioned problem, the integrated circuit 16 of FIG. 6 uses only rising edges for clock recovery. Hence, the distorted falling edges are avoided altogether. As becomes apparent from viewing the amplified digital signal of FIG. 31, rising edge to rising edge timing is not affected by the slow falling edges. Therefore, the clock can be accurately recovered.

FIG. 30 illustrates a circuit 93 including a Schottky diode detector 94, and an antenna 44 connected to the Schottky diode detector 94. More particularly, in the illustrated embodiment, the Schottky diode detector 94 includes a Schottky diode 96 having a cathode connected to the antenna 44 and an anode. The Schottky diode detector 94 further includes a current source 98 driving current in the direction from the anode to the cathode of the Schottky diode 96 and through the antenna 44. The Schottky diode detector 94 further includes a capacitor 100 connected between the anode of the Schottky diode 96 and ground; and a capacitor 102 connected between the anode of the Schottky diode 96 and an output of the diode detector 94 which is connected to an amplification circuit. The same technique used with respect to FIG. 29 can also be implemented for the Schottky diode detector circuit of FIG. 30. However, for this case, only the rising edges are significantly distorted, since the Schottky diode is reversed in direction. Therefore, only the falling edges are used in clock recovery.

Details of Method of Forming an IC Schottky Structure

A method of forming a Schottky structure that can be employed to manufacture the Schottky diode detector will now be described. A Schottky diode is a diode in which a metal and a semiconductor form a pn junction. Electrons injected into the metal have a higher energy level than the charge carriers in a semiconductor, and energy storage at the junction is low because current flow is not accompanied by hole lmovement.

One embodiment of the invention comprises a Schottky diode 220 including an n+ region 222 generally encircling or surrounding an n-well region 224 (FIG. 41). In the illustrated embodiment, the n+ region 222 is heavily doped; e.g., $1\times10^{18}$ atoms/$cm^3$ or greater of n-type material, and the n-well region 224 is lightly doped; e.g., $1\times10^{17}$ atoms/$cm^3$ or lower of n-type material. The n-well region 224 defines a contact area 226, and the n+ region 222 provides a low resistance interconnect to the Schottky diode 220. The n+ region 222 has a diffused edge 228, and the n-well region has a contact edge 230. The distance from the n+ region diffused edge 228 to the n-well region contact edge 230 is minimized. In one embodiment, the distance from the n+region diffused edge 228 to the n-well region contact edge 230 is less than twenty micrometers. In a more preferred embodiment, the distance from the n+ region diffused edge 228 to the n-well region contact edge 230 is about two micrometers.

More particularly, the integrated circuit 16 includes a grid pattern of n+ regions 222. Each region 222 generally encircles or surrounds isolated n-well regions 224 of a large common n-well region 232 under the n+ regions 222 (FIGS. 41 and 42). This provides for parallel connection of a selectable number of Schottky diodes 220. As described elsewhere, the parallel connection of Schottky diodes 220 acts a single Schottky diode, and allows use of standard sized contact holes. The number of Schottky diodes 220 connected together is selectable to tailor resistance, parasitic capacitance, and electrostatic discharge sensitivity for a specific application.

To form the grid of Schottky diodes 220, the following process steps are performed.

First, a p− substrate 234 is provided (FIG. 38). Next, n-well region 232 is defined relative the substrate 234. Next, an insulator 236 is formed over the n-well region. In one embodiment, the insulator 236 is borophosphosilicate glass (BPSG).

Next, a removal or etching step is performed to remove areas of the insulator 236 for definition of contact holes 238, and areas 240 generally encircling or surrounding the contact holes 238 (FIG. 39). The contact holes 238 are not necessarily circular in cross-section; any cross-sectional shape is possible. Similarly, any cross-sectional shape is possible for the areas 240 surrounding the contact holes 238. In a preferred embodiment, the contact holes 238 all have the same diameter (or peripheral extent) to facilitate subsequent filling of the contact holes 238 (described below in greater detail). In an alternative embodiment, different contact holes 238 have different sizes. In the process of the illustrated embodiment, the contact holes 238 do not need to be completely filled with a conductor, and all contact holes therefore do not need to be the same size.

In the illustrated embodiment, the n+ regions 222 are formed in the n-well region 232 by diffusion after the etching has been performed, via the openings 240 surrounding the contact holes 238. The n+ regions 222 can be formed by other processes or in other sequences. For example, the n+ regions 222 can be formed before the insulator 236 is formed over the n-well region 232.

Next, a Schottky forming metal 242 such as titanium is formed in the contact hole openings. In the illustrated embodiment, the Schottky forming metal is deposited on the surface of n-well regions 224 via the contact hole openings 238. In one embodiment, the thickness of the deposited metal is about 200 Å. The metal is annealed to form a stable silicide interface to the n-well silicon.

If it is desired to fill the contact holes, a material such as tungsten 246 may be deposited into the contact holes (FIG. 40). The tungsten is then planarized to form final contact structures (FIG. 41).

Then, an interconnect metallization step is performed (FIG. 42). For example, copper doped aluminum 248 is deposited (e.g. sputtered) over the wafer, then the wafer is masked and etched to remove unwanted areas. The mask defines a pattern to interconnect the contacts as desired.

A variable number of Schottky diodes may be connected in parallel by simply changing the metal masks and interconnecting only the number of Schottky diodes required by a particular circuit application. In one illustrated embodiment, an array of twelve by twelve Schottky diodes (144 total Schottky diodes) is provided (FIG. 43). In another embodiment (FIG. 42), less than all available Schottky diodes are connected together. In one embodiment, only a six by six array (36 Schottky diodes) is connected together in parallel.

In one alternative embodiment, aluminum is employed instead of tungsten and silicide. In another alternative embodiment, tungsten is employed instead of aluminum to interconnect contacts, and the step of forming tungsten plugs is omitted.

In an alternative embodiment (FIG. 47), each Schottky diode includes a p+ region 252 encircling a "p−" p-well region 254 and is formed by a method substantially identical to the method described above except with p-type material substituted for n-type material and vice versa. More particularly, in this alternative embodiment, the following steps are performed.

First, an n-type substrate 256 is provided (FIG. 44). Next, a common p-well region 258 is defined relative the substrate 256. The common p-well region 258 defines the p-well regions 254 for each of the Schottky diodes. Next, an insulator 260 such as borophosphosilicate glass (BPSG) is formed over the p-well region 258. Next, an etching step is performed to etch away regions of the insulator for definition of contact holes, and areas 264 generally encircling or surrounding the contact holes (FIG. 45). In a preferred embodiment, the contact holes 262 all have the same diameter (or peripheral extent) to facilitate subsequent filling of the contact holes 262 with Tungsten or another conductor. In an alternative embodiment, different contact holes 262 have different diameters. In the process of the illustrated embodiment, the contact holes do not need to be completely filled, and all contact holes therefore do not need to be the same size.

In the illustrated embodiment, the p+regions 252 are formed in the p-well regions by diffusion after the etching has been performed, via the openings 264 encircling the contact holes. The p+regions 252 can be formed by other processes or at other times. For example, the P+regions 252 can be formed before the insulator is formed over the p-well region 258.

Next, a Schottky forming metal 266 such as Titanium is formed in the contact hole openings 262. In the illustrated embodiment, the Schottky forming metal 266 is deposited on the surface of the p-well region 258 via the contact hole openings 262. In one embodiment, the thickness of the deposited metal is about 200 A. The metal 266 is annealed to form a stable silicide interface 268 to the p-well region 258.

If it is desired to fill the contact holes 262, a metal such as tungsten 270 is deposited into the contact holes (FIG. 46). The tungsten 270 is then planarized to form final contact structures.

Then, an interconnect metallization step is performed (FIG. 47). For example, copper doped aluminum 272 is deposited (e.g. sputtered) over the wafer, then the wafer is masked and etched to remove unwanted areas. The mask defines a pattern to interconnect the contacts as desired.

The above described processes for forming a Schottky diode are preferred over a process wherein, after the contact holes a etched, ion implantation of phosphorus into the holes is performed. In such a process, the implant would be a two step process, with a low energy implant (e.g., 35 keV of $4\times10^{12}$ ions/$cm^2$) followed by a high energy implant (e.g., 120 keV of $4\times10^{12}$ ions/$cm^2$). Such implants cause a high doping level at the bottom of the contact hole, which prevents formation of a low leakage Schottky diode. The preferred processes described above eliminates these two contact implants, and allows for formation of a good quality Schottky diode.

FIGS. 8.0101AA–CB provide a circuit drawing of the Schottky diode detector "diodedet." FIGS. 8.0101AA–CB actually show two Schottky diode detectors. The lower Schottky diode detector shown in FIGS. 8.0101AA–CB is a replicated or dummy detector which generates a signal for the compliment side of the differential amplifier "videoamp1." The structure of the dummy Schottky diode detector is similar to the real Schottky diode detector so that any noise coupled through ground or possibly through Vdd is replicated on both sides of the differential amplifier "videoamp1" and so that the common mode rejection of the amplifier will result in little noise making it through the amplifier chain. Bias current to the Schottky diode detector is provided by the current source transistors having gates connected to "BIAS1" and "BIAS2" respectively. A path for that current is through the antenna. Thus, the antenna is biased to a high potential Vdd. The array of capacitors in FIGS. 8.0101AA–CB is a series capacitance that couples the output of the Schottky detector to the input of the video amp "videoamp1" and allows an independent bias level to be set at the input of the video amp "videoamp1." The value of that capacitor in conjunction with the effective resistance seen looking into the amplifier "videoamp1" determines the high pass response of the amplifier "videoamp1." The values of the capacitor and effective resistance determine the lowest frequency at which the amplifiers can respond, and that frequency is selected to be low enough so that none of the information contained in the base band signal is lost.

FIGS. 8.0102AA–BD provide a circuit drawing of the CMOS detector "cmosdet" which is employed in an alternative embodiment.

Details of Ouick Bias AC-Coupled Video Amplifier

FIG. 48 provides a simplified circuit schematic of a quick bias AC-coupled video amplifier 270. The video amplifier goes from a power down (unbiased) state to a fully biased state quickly despite a large value effective resistance and capacitor used to bias and couple the amplifier.

The video amplifier 270 has an input adapted to be connected to $V_{in}$ and includes coupling capacitors 292 and 294 at the input.

The video amplifier includes a voltage divider 276 including two resistors 278 and 280 in series, and four transistors 282, 284, 286, and 288 shown to the right of a voltage divider in FIG. 48. Transistors 286 and 288, the rightmost two of the four transistors, are long L (length), narrow W (width) p-channel devices operated in linear mode to provide very high effective resistance $R_{EFF}$. Transistors 286 and 288 are used instead of resistors because it is hard to provide high resistances using resistors without generating undesirable parasitic capacitance and without taking up more space on an integrated circuit die. The video amplifier 270 includes a differential amplifier 290. The voltage divider 276 sets a bias voltage at the inputs of the differential amplifier 290. The effective resistance $R_{EFF}$, in conjunction with the value of coupling capacitor 292 or 294, sets the angular high pass roll off frequency for the amplifier according to a relationship of $\omega_{HP}=1/((R_{EFF}+R1\|R2)C1)$ where ω is angular frequency (2π times frequency), R1 and R2 are the values of the resistors 278 and 280 included in the voltage divider 276, and C1 is the value of one of the coupling capacitors. The values of $R_{EFF}$, and the coupling capacitors are adjusted to achieve the desired high pass roll off frequency $\omega_{HP}$ as illustrated in FIG. 49. The high pass roll off frequency determines what frequencies will be amplified or attenuated. The high pass roll off frequency is set low enough so that important data is not excluded.

In many applications, the values of these components are high. For example, in the integrated circuit 16, $R_{EFF}$ is approximately two MegaOhms, and the capacitance of each of the coupling capacitors 292 and 294 is approximately one picoFarad, which gives an angular high pass frequency of approximately 1((2 MegaOhms)(1 pF))=500 kiloradians/second, or a high pass frequency of 500/2π=79.6 kHz.

In a powered down state, input $V_{reg}$ is zero. Upon power up, there is a delay before the inputs reach the desired bias voltage, according to a relationship $V_{BIAS}=R1/(R1+R2)V_{reg}$. The time constant equals $R_{EFF}C1$ which is approximately equal to two microseconds.

If it is decided to wait five time constants, this requires about ten microseconds.

In accordance with the invention, transistors 282 and 284 are added (the two leftmost transistors of the four). These are short L (length) wide W (width) devices which allow the bias voltage to be established in much less time by shorting around the high resistance of the right two transistors 286 and 288. The time constant is thereby reduced. This shorting occurs when an input RXEN is low. Before using the circuit as an amplifier, RXEN is taken high (after bias voltage is achieved). This restores the desired frequency behavior. FIGS. 8.0103AA–CF provide a circuit drawing of the video amp "videoamp1." The video amp "videoamp1" is a differential amplifier with a cascode device isolating a resistor load from differential transistors of the amplifier. This lowers capacitance and improves the frequency response of the amplifier. Bias is provided by a resistor divider shown on the upper left of FIGS. 8.0103AA–CF, which resistor divider provides a potential to two p-channel transistors found almost in the center of the FIGS. 8.0103AA–CF. Each of these p-channel transistors defines a very large resistance, effectively on the order of one to two megaohms connecting to the nodes of the amplifier to provide the bias. The remaining p-channel devices shown left of center in FIGS. 8.0103AA–CF are shorting devices which short out the two p-channel transistors during the period when the receiver is being powered on out of the sleep mode. The function of these remaining p-channel devices is to cause the inputs to the receiver to come up to the bias level as quickly as possible. They are then shut off in order to leave the circuit with only the high resistance p-channel devices providing the bias. This is necessary from a frequency response standpoint.

FIGS. 8.0104AA–BC provide a circuit drawing of the video amp "videoamp2." The video amp "videoamp2" operates in a manner similar to operation of the video amp "videoamp1." The video amp "videoamp1" has a higher bias current than the video amp "videoamp2." The reason for this is to minimize the noise generated in the amplifier.

FIGS. 8.0105AA–EE provide a circuit drawing of the comparator "comparator." The comparator has biasing considerations similar to the biasing considerations for the video amps, and has a biasing network shown at the left in FIGS. 8.0105AA–EE, at the inputs, which is similar to the biasing networks in the video amps. The function of the comparator "comparator" is to ensure an output at a full digital level.

FIGS. 8.0106AA–CD provide a circuit drawing of an RF detect circuit "rxdet." This circuit generates an RF detect signal. The circuit includes an input switch that is either high or low, and a capacitor. If the input switch is high for a sufficient percentage of the time, the input switch will charge up the capacitor. The capacitor has a continual discharge leakage current. As long as the input switch is high sufficiently frequently, the input switch will overcome the capacitor leakage current, and the circuit "rxdet" will put out an RF detect signal.

FIGS. 8.0107AA–GN provide a circuit drawing showing construction details of the receiver bias generator "rxbias." The receiver bias generator includes a series of current mirrors to produce bias currents for various stages of the receiver.

FIGS. 8.0108AA–AC provide a circuit drawing showing construction details of a data transition detector "datatx." The data transition detector has an input connected to the digital level output of the comparator "comparator" of the receiver "rx" in FIGS. 8.01AA–DE. The data transition detector generates a high going pulse every time there is a transition from high to low or from low to high in the data output by the comparator "comparator." These transitions are tested by other circuitry, described below, to determine whether or not a valid signal is being received.

Details of Low Power Frequency Locked Loop

As previously discussed, the integrated circuit 16 periodically checks if a radio frequency signal is being received by the receiver. The integrated circuit 16 includes a timer setting the period for the checking, the timer comprising a frequency locked loop "lpfll."

The low power frequency locked loop "lpfll" is shown in greater detail in FIGS. 8.02AA–BC. This is also shown in a simplified schematic in FIG. 24. In the embodiment shown in FIG. 24, the device 12 includes a frequency locked loop (or phase locked loop) 54, a divider 55 coupled to the input of the loop 54, and a divider 56 coupled to the output of the loop 54. A clock (e.g. 9.54 MHz) that is recovered from an incoming radio frequency command from the interrogator 26 is supplied to the frequency locked loop (or phase locked loop) 54 after being passed through the divider 55. The terms "phase locked loop" or "frequency locked loop" as used herein are meant to describe physical structure, not a state of operation. The term "locked" does not imply that the circuitry is operating, or functioning in a locked condition. Thus, as used herein, "locked" is a term for assisting definition of a particular circuit configuration and is not meant to imply a required state of operation for the circuit. To avoid ambiguity, the appended claims use the terms "phase lock loop" or "frequency lock loop" instead of "phase locked loop" or "frequency locked loop" to indicate that state of operation is not being claimed.

Phase locked loops and frequency locked loops are similar to one another, except that a phase locked loop tracks phase as well as frequency. A phase locked loop includes a phase detector having a first input receiving the incoming message, having a second input, and having an output; a loop filter having an input coupled to the output of the phase detector and having an output; a voltage controlled oscillator having an input coupled to the output of the loop filter, and having an output defining an output of the phase locked loop; and a divider having an input coupled to the output of the voltage controlled oscillator and having an output connected to the second input of the phase detector. The phase detector produces an output voltage proportional to the phase difference of two input signals. The loop filter is used to control the dynamics of the phase locked loop. The voltage controlled oscillator produces an AC output having a frequency proportional to input control voltage. The divider produces an output signal having a frequency that is an integer division of the input signal. The loop filter includes a capacitor on a control node of the voltage controlled oscillator.

The frequency locked loop 54 includes a frequency comparator 57 receiving the divided recovered clock, an up/down counter 58 connected to the output of the frequency comparator, and a current controlled oscillator 59 connected to the output of the up/down counter. The output of the current controlled oscillator 59 is fed back to the frequency comparator 57, and to the divider 56. The divider 56 is programmable (in response to a radio frequency command from the interrogator 26) in one embodiment of the invention. To conserve power, the loop 54 is enabled only during processing of a command from the interrogator 26, during which time a recovered clock reference signal is available. In the illustrated embodiment, the current controlled oscillator 59 is a low power current controlled oscillator "lpcco" shown in FIGS. 8.0204AA–EJ.

FIGS. 8.02AA–BC provide a circuit drawing of the low power frequency locked loop "lpfll." This circuit generates a clock which is used in multiple places to time the interval between wake ups. The clock is used as a reference for the timed lock out function, and for the alarm timer wake up function. In a preferred embodiment, the low power frequency locked loop "lpfll" generates a 8 kHz clock. The low power frequency locked loop includes a current controlled oscillator "lpcco" that consumes very little current and that runs continuously from the time power is first supplied to the integrated circuit 16 ("power up") until power is removed from the integrated circuit 16. During power up, the low power frequency locked loop "lpfll" attempts to synchronize to the main clock recovery oscillator "dcr" (described below). However, that oscillator is not calibrated to anything yet because it has just been powered on. Still, an initial frequency is set for the low power frequency locked loop "lpfll." On the first successful communication with an interrogator, the low power frequency locked loop "lpfll" is actually calibrated to a known clock frequency and set to a desired frequency (8 kHz in the illustrated embodiment).

The low power frequency locked loop includes a divider shown at the top of FIGS. 8.02AA–CB. The divider divides down an input clock signal. In the illustrated embodiment, the input clock signal is a 9.5 MHz clock signal. The input clock signal is divided down by a desired factor to get a reference clock for the actual loop shown at the bottom of FIGS. 8.02AA–CB. In the preferred embodiment, the reference clock for the loop shown in FIGS. 8.02AA–CB runs at 8 kHz. The loop receives a loop enable signal "LoopEN", shown at the lower left of FIGS. 8.02AA–CB. The loop enable signal "LoopEN" enables this frequency locked loop to operate in a loop configuration. The loop enable signal "LoopEN" is asserted when a valid message has been certified and on power up. Those are the only two times the loop enable signal is asserted.

The frequency of the current controlled oscillator "lpcco" is determined by current input into the current controlled oscillator "lpcco." A selection of the number of current steps for controlling the oscillator is made by the outputs of the up/down counter "udcounter." The up/down counter has outputs select 1 "Sel1," select 2 "Sel2," select 4 "Sel4," and select 8 "Sel8." The outputs of the up/down counter are labelled according to their binary weights, and that is also how currents are rated within the current controlled oscillator. When the loop is disabled, at the end of processing of a valid command, the count on the output of the up/down counter is frozen so that the select 1 through select 8 lines remain constant and they keep that same frequency in the low power frequency locked loop "lpfll" until the next valid command is processed. At the time when the next valid command is processed, if the clock frequency of the low power frequency locked loop has drifted, the loop sets the frequency back to the desired frequency (e.g., 8 kHz).

FIGS. 8.0201AA–AB provide a circuit drawing showing construction details of a timed lockout divider cell "tldcel bypass" included in the circuit of FIGS. 8.02AA–BC.

FIGS. 8.0202AA–CD provide a circuit drawing of a frequency comparator "freqcomp" of the frequency locked loop "lpfll." The frequency comparator counts a certain number of cycles of the reference clock and also counts how many cycles of the low power clock occurred within that number of cycles. The frequency comparator thus determines whether the low power clock "lpfll" is running too fast, too slow, or on time. If the clock is running too fast or too slow, the frequency comparator makes an adjustment by causing the counter "udcounter" to either count up or count down. If no adjustment is necessary, the frequency comparator makes no adjustment to the counter.

FIGS. 8.0203AA–BC provide a circuit drawing showing construction details of the up/down counter "udcounter" included in the low power frequency locked loop "lpfll." The counter has some logic on the counter's output so that if the counter counts all the way down to zero, the counter does not wrap around and go to all ones. Instead, the counter stops at zero (until a signal requesting an up count is received). Similarly, if the counter counts all the way up to all ones, the counter does not wrap around to all zeros. Instead, the counter stops at all ones (until a signal requesting a down count is received).

FIGS. 8.020301AA–BB provide a circuit drawing showing construction details of an adder "udcounter_adder" included in the up/down counter.

FIGS. 8.020302AA–AB provide a circuit drawing showing construction details of a D type flip-flop "udcounter_dff" included in the up/down counter.

Details of Low Power Current Controlled Oscillator

The integrated circuit 16 includes the low power current controlled oscillator "lpcco." The oscillator consumes very little current (e.g., less than 100 nA). The oscillator "lpcco" includes digital input lines, and oscillates at a frequency controlled by the digital input lines. The circuit includes a thermal generator, a digitally controlled current mirror, an oscillator, and an output driver.

FIGS. 8.0204AA–EJ provide a circuit drawing of the low power current controlled oscillator "lpcco." The low power current controlled oscillator "lpcco" includes a thermal voltage generator, including a string of resistors, shown in FIGS. 8.0204AA–EJ in the upper left corner. The thermal voltage generator generates a small voltage proportional to kT/q across the string of resistors where k is Boltzmann's constant, $1.38\times10^{-23}$ Joules per degree Kelvin, T is temperature in degrees Kelvin, and q is the electron charge in Coulombs. The voltage kT/q is approximately equal to 26 mV at room temperature. That small voltage divided by the resistor value sets the current in the circuit. This current is approximately equal to (kT/qR) ln ((W/L)Q1)/(WIL)Q2). In the illustrated embodiment, the current is set to a low value (e.g., approximately three nano-amps).

Thermal generators are known in the art. See for example, "CMOS Analog Integrated Circuits Based on Weak Inversion Operation" by Eric Vittoz and Jean Fellrath, IEEE Journal of Solid-State Circuits, Vol. SC-12, No. 3, June 1977. See particularly FIG. 8 of this article, and the associated description.

The low power current controlled oscillator "lpcco" also includes a wake up circuit shown to the far left of the thermal voltage generator that causes a much higher current to flow initially to turn on the feedback loop. The wake up circuit then shuts off and leaves the low value (nano-amp) current flowing. Thus, initialization occurs on power up and the wake up circuit is off after that unless power is removed and reapplied. The outputs of the up/down counter "udcounter," select 1 "Sel1," select 2 "Sel2," select 4 "Sel4," and select "Sel8" come into the low power current controlled oscillator as shown on the left edge of FIGS. 8.0204AA–EJ. The low power current controlled oscillator further includes control circuitry shown on the bottom strip of FIGS. 8.0204AA–EJ. These outputs of the up/down counter control the number of currents that are mirrored into this control circuitry by a current mirror. The current mirror is digitally controlled and weightings are binary in the illustrated embodiment; however, any weighting scheme can be used. The current mirror includes transistors operating in the subthreshold, or weak inversion mode, due to the extremely low current level.

More particularly, referring to FIGS. 8.0204AA–EJ, there are five transistors to the right of the string of resistors, mirrored down to one about the center of the page providing a divide by five. Current is then mirrored through all the p-channel devices. The block shown in the upper right of FIGS. 8.0204AA–EJ is a selectable current mirror. The first stage generates one current equal to the reference current and that is always flowing into the n-channel diode down at the bottom of that stack. Shown to the right of the n-channel diode are the selectable groups of p-channels. The first one has one, the next two, the next four, the next eight in a binary sequence. The transistors shown below the p-channels transistors are select devices and they are controlled by the digital signals select 1 "Sel1," select 2 "Sel2," select 4 "Sel4," and select 8 "Sel8." Thus, the number of currents can be selected and however many are selected are added into the one that is always flowing in the diode.

The current from groups of p-channel transistors that are not selected is diverted over to a separate or second diode shown on the far right of FIGS. 8.0204AA–EJ. This is so that when a block of transistors is not selected, their drain nodes do not get pulled up to $V_{DD}$. By sinking the current in this second diode, the voltage at the drain node of an unselected block of transistors is kept down near the voltage at which it will operate when and if it is actually connected over to the first diode. This is so that, upon switching a select line, a capacitance doesn't have to be charged from $V_{DD}$ down to the proper operating voltage. In any case, the selected number of currents are added together into the first diode, and then that voltage is carried on the line shown in FIGS. 8.0204AA–EJ as going down the right side of page, which line has a capacitor tied to it. That capacitor is a filter capacitor so that the voltage on that node does not change abruptly when the select lines change or when some unrelated signal nearby switches. Since all of these transistors are operating in a sub-threshold or weak inversion mode, a small change in the voltage on their gate will otherwise result in a rather large impact on the operation of the circuit. That line is the input for the circuitry shown across the bottom of FIGS. 8.0204AA–EJ. There is a current mirror situation there, so that the sum of all the selected currents plus the one default current flowing in the diode above is mirrored and flows through the p-channel devices of this circuitry. There is then another mirror to generate bias voltages for the n-channel current source devices for the VCO ring oscillator. The p-channel gate voltages are used in mirroring into the p-channel load devices of the same ring oscillator. The frequency of this ring oscillator is controlled by the current mirrored to them.

The low power current controlled oscillator includes a four stage ring oscillator. The frequency of oscillation is approximately proportional to the amount of current flowing. The frequency of oscillation of the four stage ring oscillator is directly proportional to its bias current over a wide range of frequencies. For example, frequency is directly proportional to bias current for frequencies between approximately 100 Hz and tens of MHZ (e.g. to twenty MHZ).

The low power current controlled oscillator further includes an output driver. In the illustrated embodiment, the output driver includes a comparator circuit receiving the output of the fourth stage ring. The purpose for this comparator is to convert the small output signal of the oscillator to full digital levels. In the illustrated embodiment, full digital levels are zero volts and $V_{DD}$. In the illustrated embodiment, $V_{DD}$ is 3.3 Volts ±0.3 Volts. In an alternative embodiment, $V_{DD}$ is 5 Volts ±10 or 20%. Another other suitable values can be employed for $V_{DD}$ and the digital levels.

Circuitry is included to eliminate the crossover current in the n and p channel devices in the first few invertors. This is because, when operated at very low current levels, the rise and fall times are long and could allow substantial current to flow in the n and p channel devices during switching.

The digital levels are buffered and amplified up by the comparator to provide an output signal from the low power frequency locked loop "lpfll." The output of the low power current controlled oscillator is shown on the right edge of FIGS. 8.0204AA–EJ. In the illustrated embodiment, the low power current controlled oscillator operates at eight kHz. However, if desired for alternative embodiments, the low power current controlled oscillator is capable of running at a frequency from approximately 100 Hz to 20 kHz. In an alternative embodiment, the low power current controlled oscillator is capable of running at a frequency from approximately 100 Hz to 30 kHz.

The low power current controlled oscillator consumes very little power. For example, in the illustrated embodiment, the low power current controlled oscillator consumes less than a milliamp. More particularly, in the illustrated embodiment, the low power current controlled oscillator consumes approximately 100 nanoAmps.

In an alternative embodiment, instead of using a thermal voltage generator, a transistor is biased in the subthreshold region in order to define the current source and to generate a small current. However, in this embodiment, the voltage on the gate of the transistor is updated periodically as it leaks away.

Although the low power current controlled oscillator has been described in connection with a radio frequency identification device, the low power current controlled oscillator can be advantageously employed in any battery powered electronic product which must keep track in time.

FIGS. 8.03AA–AB provide a circuit drawing showing construction details of a counter bit "lpfllcbit" included in the receiver "rx."

FIGS. 8.04AA–EE provide a circuit drawing of the wake up controller "rxwu." An input to the wake up controller is a clock signal "LPCLK" from the low power frequency locked loop "lpfll." This clock signal input is shown in the upper left of FIGS. 8.04AA–EE. The clock signal "LPCLK" is further divided down to provide certain time intervals available for selection. These are the time intervals at which the integrated circuit 16 will wake up and look for a radio frequency signal. In the illustrated embodiment, these time intervals are set at 0.5, 16, 64 and 256 milliseconds. The selection of one of these multiple available time intervals is accomplished via radio frequency command from the interrogator.

The wake up controller includes wake up abort logic shown in the lower left of FIGS. 8.04AA–EE. The wake up abort logic performs a number of tests (described elsewhere herein) to determine whether the received signal is a valid signal and, if all tests are passed, then the wake up controller asserts a signal on line "RXWU" shown on the right of FIGS. 8.04AA–EE. This signal wakes up the processor, and the processor then processes the command contained in the message.

Details of Wake Up Tests

FIGS. 8.0401AA–AB provide a circuit drawing of a wake up abort logic circuit "wuabort." The wake up abort logic circuit provides for conservation of battery power. If what is received is not a valid message, the wake up abort logic circuit determines this quickly and the device returns to the sleep mode so that the battery is not drained on invalid messages or spurious communication. The wake up abort logic circuit works by counting clock cycles. The wake up abort logic circuit has as an input a clock signal "CHIPCLK" that is the output of the clock recovery oscillator "dcr" (described below). This clock signal is divided down by a factor of four, which results in a value approximately equal to the spread spectrum chip rate. After the clock is actually acquired from a message from the interrogator, the resulting value will be equal to the chip rate.

Initially though, when these wake up tests are performed, a clock has not yet been acquired from a message. The wake up abort logic includes an RF Detect Timer, shown on the top, left of FIGS. 8.0401AA–EE, which performs a first test. The RF Detect Timer counts a predetermined number of cycles of the clock (e.g., 13 cycles) and, if the RF detect signal from the receiver is not asserted, the wake up is aborted. On the other hand, if the RF detect signal is asserted within those cycles, the wake up abort logic starts the next series of tests without waiting for the end of the predetermined number of cycles.

The next series of tests are timed by a counter shown across the center of the page in FIGS. 8.0401AA–EE. For the next tests, transitions in the incoming data stream are counted within a certain time interval and the number of transitions must fall within a certain range in order to pass the test. Transitions are counted by the counter shown at the bottom in FIGS. 8.0401AA–EE. The range limits are set by knowing the number of transitions that should occur in the data within the amount of time allowed. This is known because each data bit is encoded as a thirty-one chip sequence as described elsewhere herein. The reason there is a range is because the clock has not yet been acquired accurately so there is a range of clock frequencies that must be considered. In the illustrated embodiment, one test checks whether, after five counts of the clock, there has been between greater than or equal to one, and less than eight transitions in the data. If not, the wake up is aborted and the device goes back to sleep. If yes, then the next test is performed.

The next test checks whether, after twenty-six clock counts, there are greater than or equal to fourteen and less than thirty-two transitions in the data. If not, wake up is aborted and the chip goes back to the sleep mode. If this test is passed, the wake up abort logic circuit performs tests relating to signals generated by the clock recovery nodes. One such test is a test for chip lock. Chip lock is an indication that clock recovery is proceeding and has actually gotten within a few percent of the desired clock frequency. The final check is whether frequency lock has occurred. Again, these tests are timed. If one of the signals is not asserted by the time the timer signal goes high, then the wake up will be aborted and the device goes back to sleep and will try again after another wake up interval. Frequency lock will come into the logic in the center of the page in FIGS. 8.04AA–CB, and that is what causes the RXWU signal to be asserted, thus waking up the processor.

Another function of the wake up abort logic shown in FIGS. 8.0401AA–EE is to discriminate between high rate and low rate. The wake up abort logic measures time while these tests are performed to determine when the interrogator is in high rate, but the chip is in low rate or vice versa and abort out of wake up (return to the sleep mode).

These tests will now be described in connection with flowcharts illustrated in FIGS. 25–27.

The wake up controller "rxwu" was described above in connection with FIGS. 8.04AA–EE. The wake up tests performed by the wake up controller are illustrated in flow chart form in FIGS. 25–26.

When the integrated circuit 16 first wakes up, bias generators and the receiver "rx" are powered on (step S1 in FIG. 25). After ensuring that the bias is on (step S2 in FIG. 25), the master clock "dcr" is started. By design, the master clock "dcr" starts at a frequency below the final frequency it will achieve after the clock recovery circuit "lpfll" extracts the clock frequency from the incoming signal. More particularly, in the illustrated embodiment, the master clock starts at a start frequency above half of the final frequency it will achieve after the clock recovery circuit "lpfll" extracts the clock frequency from the incoming signal. Still more particularly, in the illustrated embodiment, the master clock starts at a start frequency between half and three a quarters of the final frequency the master clock will achieve after the clock recovery circuit "lpfll" extracts the clock frequency from the incoming signal. In the illustrated embodiment, the final frequency is 38.15 MHZ, and the start frequency is between 20 and 30 MHZ. The master clock includes a frequency locked loop including a voltage controlled oscillator. An offset is applied to the oscillator to make sure that the clock starts at least as fast as 20 MHZ. Then, the frequency locked loop adjusts the frequency to 38.15 MHZ.

Because the clock has not yet been acquired from the incoming signal, the clock is a free running oscillator when providing the start frequency. Initial wake up tests are performed at this lower start frequency. The receiver "rx," digital clock and data recovery circuit "dcr," pseudo random number processor "pnproc," and voltage controlled oscillator "vco" are turned on (step S3 in FIG. 25).

The input radio frequency signal received from the interrogator 26 is a direct sequence spread spectrum input signal in the illustrated embodiment. Spread spectrum techniques are described above. In one embodiment, incoming radio frequency commands are included in packets that contain, in order of transmission, a preamble, a Barker code, and the command. In one embodiment, each bit of the incoming radio frequency command sent by the interrogator is modulated using a pseudo noise (PN) sequence for direct sequence spread spectrum communication.

After the clock is running, the device 12 is in a receiver on mode illustrated in FIG. 27 by a vertical line marked "WAKEUP RX ON." After the clock is running, the device 12 performs wake up tests (at the lower or start frequency).

A first test is whether the receiver "rx" detects any radio frequency signal within a predetermined number of clock cycles (step S4 in FIG. 25). In the illustrated embodiment, this predetermined number of clock cycles is 13. If no radio frequency signal is detected by the is receiver "rx" within 13 clock cycles, the device 12 returns to the sleep mode. If a radio frequency signal is detected by the receiver "rx" within 13 clock cycles, the device 12 switches to a wake up abort test mode illustrated in FIG. 27 by a vertical line marked "WAKEUP ABORT TESTS," and a second test is performed.

In the second test, a determination is made as to whether a predetermined number of data transition pulses occur within a predetermined number of clock pulses for the radio frequency signal detected by the receiver "rx" (step S5 in FIG. 25). More particularly, the device 12 includes a long counter shown in FIGS. 8.0401AA–EE driven by a clock signal "CHIPCLK." The device 12 further includes a circuit "datatx" which detects transitions in the signal received by the receiver "rx" and generates a pulse ("DTX" in FIG. 26) at each transition. The device 12 further includes another counter circuit shown in FIGS. 8.0401AA–EE which counts these pulses. Because a valid incoming signal is modulated with a known PN sequence, the number of transitions in a given time for a valid incoming signal is known. The device 12 includes logic "wuabort" that tests whether the proper number of data transition pulses occur within a certain number of clock pulses. More particularly, in the illustrated embodiment, the logic tests whether more than or equal to one and less than eight such data transition pulses occur within five chips. If not, the device returns to the sleep mode. If so, a third test is performed.

In the third test, a determination is made as to whether a predetermined number of data transition pulses occur within a predetermined number of clock pulses for the radio frequency signal detected by the receiver "rx" (step S5 in FIG. 26). The third test is similar to the second test, except that the number of data transition pulses is tested against a number of clock pulses that is different from the number in the second test. More particularly, in the illustrated embodiment, the logic tests whether more than or equal to fourteen and less than thirty-two such data transition pulses occur within thirty-one chips. If not, the device 12 returns to the sleep mode.

If the above transition tests are passed, the device 12 checks to see if the clock recovery circuit locks onto the incoming clock rate. More particularly, in the illustrated embodiment, a determination is made as to whether a clock is acquired from the incoming signal within 6 k chips (step S7 in FIG. 26). A determination is then made as to whether frequency lock is achieved within 16 k chips (step S9 in FIG. 26). The device 12 returns to the sleep mode if any of these tests fail. If these tests are passed, then the device 12 enters a processor on mode illustrated in FIG. 27 by a vertical line marked "PROCESSOR ON." Power is supplied to the processor (step S10 in FIG. 26) and the device 12 waits for the preamble of the incoming message to end and the command to begin.

In one embodiment, the tests of FIG. 26 are employed to distinguish between incoming signals with different possible valid chipping rates.

More particularly, in the illustrated embodiment, it is known how long each of the various tests should take for valid low chipping rate or high chipping rate signals, and this information can be tested to determine whether the incoming signal is a high rate or low rate signal.

Other appropriate tests can be performed in embodiments where spread spectrum is not employed. In these embodiments, knowing how valid data is encoded, the wake up timer and logic still compares the number of transitions received in a given amount of time with an expected number of transitions for a valid signal.

FIGS. 8.040101AA–AB provide a circuit drawing showing construction details of a counter bit "wuabort-cbit" included in the wake up abort logic.

FIGS. 8.0402AA–AB provide a circuit drawing showing construction details of a timed lockout divider cell "tldcel" included in the receiver wake up controller.

Details of Lock Detection in a Digital Clock Recovery Loop

In many communications systems, it is necessary to recover a clock signal from the received data. A phase locked loop is one way of recovering such a clock signal. In the illustrated embodiment, such a recovered clock is used as a master clock.

The integrated circuit 16 includes the digital clock and data recovery circuit "dcr" which includes a phase locked loop. The phase locked loop includes a voltage controlled oscillator "dcr_vco." The frequency of the voltage controlled oscillator always starts low, at between 50% and 75% of the final desired value. When the voltage controlled oscillator starts running, large steps are taken (FIG. 54). As the frequency approaches the final value, increasingly smaller steps are taken to achieve greater accuracy. The illustrated embodiment employs four step sizes: large, medium, medium-fine, and fine. For example, in the illustrated embodiment, large steps up are employed between 50% to 75% of the final desired value, and medium steps up are then taken above 75% until pump up commands are not issued for a predetermined number of transitions, then medium-fine steps up are employed until the final value is overshot, then fine steps down are employed.

A method is needed to determine when the frequency of the voltage controlled oscillator matches the desired frequencies contained in the received data.

The voltage controlled oscillator includes a control node having a voltage indicative of the frequency of the voltage controlled oscillator. The behavior of this node is used to determine when frequency lock has occurred.

After the phase locked loop has run long enough to get within a few percent of the final value (at a time illustrated as To in FIG. 54), a signal "SDD" (start data decoding) is generated. This signal "SDD" disables the large and medium steps and enables lock detect circuitry for determining if frequency lock has occurred. A latch "KILLSU" (kill start up) detects when the first fine step pump down occurs (at $T_1$ in FIG. 54). This enables a latch "FREQLOCK." The latch "FREQLOCK" is set when the first fine step pump up occurs (at a time illustrated as $T_2$ in FIG. 54). A signal "FREQLOCK" is then indicative that the phase locked loop has reached its final value.

In other words, large, medium, then medium-fine steps up are followed by fine steps down. The final value is overshot, and a frequency lock signal is provided upon occurrence of the first subsequent fine step up.

In the illustrated embodiment, the final value of the voltage on the control node of the voltage controlled oscillator, where frequency lock is expected, is approximately 1.2 Volts. In one embodiment, each large step is approximately several hundred millivolts, each medium step has a size approximately in the tens of millivolts (e.g., 25 millivolts), each medium-fine step has a size of approximately a few millivolts (e.g. two millivolts), and each fine step has a size approximately in the tenths of millivolts. Various other relative sizes or numbers of steps are employed in alternative embodiments.

The sizes of steps is set using current sources of different values [th]at are turned on for a fixed period of time to drive to the capacitor on the control node of the voltage controlled oscillator.

In the illustrated embodiment, the fine step generator is not disabled before time $T_0$ so there is a possibility that a combination of fine steps with larger steps can take place before time $T_0$. In an alternative embodiment, however, the fine step generator is disabled before time $T_0$.

FIGS. 8.05AA–CB provide a circuit drawing of the digital clock and data recovery circuit "dcr." The digital clock and data recovery circuit includes a phase locked loop of a digital design, and a state machine "dcr_statemachine" that drives the phase locked loop. The phase locked loop includes a voltage controlled oscillator "dcr_vco" and control circuitry "dcr_vcocontrol" for the voltage controlled oscillator. The voltage controlled oscillator "dcr_vco" includes a control node ("OUTN" and "OUTP" shown in FIGS. 8.0504AA–EE and described below in greater detail) and produces an oscillation at a rate dependent on the value of a voltage applied to the control node. In the illustrated embodiment, the state machine has four states. The phase locked loop produces an output pulse on a line "OUTC" (later labeled "FMASTER"). The digital clock and data recovery circuit attempts to place four pulses of the output clock within one chip time.

The state machine "dcr_statemachine" determines when that is not the case and, if not, whether to cause the oscillator to run faster or to run slower. The state machine "dcr_statemachine" then issues wappropriate pump up or pump down signals to drive a control node of the oscillator. The voltage controlled oscillator "dcr_vco" starts out at a minimum frequency as determined by an offset current which is present regardless of the loop. This ensures that the oscillator will start up and run at greater than 50% of the final value so that the phase locked loop will converge on the proper frequency. The digital clock and data recovery circuit also includes a PLL start-up circuit "dcr_startup." The acquisition of the clock frequency happens in stages and, initially, the control node moves in large increments towards its final value. The start-up circuit "dcr_startup" provides large increments for controlling the loop. However, as the digital clock and data recovery circuit gets closer to acquisition of clock frequency, control switches from that start up circuit "dcr_startup" over to the state machine "dcr_statemachine." The state machine provides very fine steps as the final convergence is done with very fine steps. The data stream is fed into the circuitry on the upper right. Then the data is sampled during one of the states of the state machine after it has been determined that the data is valid. The data stream is recreated and called "RXCHIPS."

FIGS. 8.0501AA–BE provide a circuit drawing of the start up circuit "dcr_startup" included in the digital clock and data recovery circuit. In the illustrated embodiment, the start up circuit provides either very large or fairly large steps dependent upon how far from frequency the oscillator is running. The start up circuit also has a counter (shown along the bottom in FIGS. 8.0501AA–BE) that determines when there have been no pump up commands issued for a given count of transitions. In the illustrated embodiment, the counter determines when there have been no pump up commands during sixteen transitions. If the given count of transitions are detected in the data and there has been no pump up command (e.g., no pump up medium or pump up fast command) then a signal is asserted on a line "SDD." SDD stands for Start Data Decode and is an indication that the control voltage has converged to within a few percent.

FIGS. 8.050101AA–BE provide a circuit drawing showing construction details of a shift register cell "dcr_sreg" included in the PLL start up circuit. FIGS. 8.050102AA–AB provide a circuit drawing showing construction details of a counter bit "dcr_counterbit" included in the PLL start up circuit.

FIGS. 8.0502AA–CD provide a circuit drawing of the state machine "dcr_statemachine." In the illustrated embodiment, the state machine has four states. The state machine includes two flip-flops with feedback signals providing the four states. This circuit generates pump up slow, and pump down slow commands for adjusting voltage on a control node of the voltage controlled oscillator.

This circuit also has the circuitry that turns off the start up circuit and generates the frequency lock signal. When trying to acquire frequency lock, there will be large and medium pump ups, without any pump downs, until the final desired value is overshot. At this point, there will be a first pump down slow pulse. When the first pump down slow command is issued, the start up circuitry "dcr_startup" is turned off, which leaves only fine step capability for adjustment in the control voltage. It takes time for the fine steps to bring down the control node voltage to the proper value and the voltage on the control node will overshoot the desired voltage in the negative direction. The state machine will detect that it has gone too far and it will step the voltage back up towards the final value and that first fine step up will be detected and at that point the frequency lock signal is asserted.

FIGS. 8.0503AA–BB provide a circuit drawing of a bias generator "dcr_bias." The bias generator includes current mirrors that generate the appropriate bias values for the various circuits in the digital clock and data recovery block.

The digital clock and data recovery circuit "dcr" includes a VCO control voltage generator "dcr_vcocontrol" which is shown in greater detail in FIGS. 8.0504AA–EE.

The digital clock and data recovery circuit "dcr" employs a phase locked loop to recover the clock frequency from an incoming radio frequency message. Phase locked loops use feedback to maintain an output signal in a predetermined phase relationship with a reference a signal.

Details of Digital Clock Recovery Loop

Operation and design of the digital clock and data recovery circuit "dcr" will now be further described with reference to FIGS. 61–72.

In many communications systems it is necessary to recover a clock signal from the received digital data stream. In the device 12, this clock signal is used as the master timing reference to eliminate the need for an external crystal-based timing reference. Typically, a phase locked loop of some type is used to extract the clock.

There are many requirements on the phase locked loop used to recover a clock signal from the received digital data stream. Several important ones for this application are that the phase locked loop must acquire the desired frequency without locking to a multiple or sub-multiple of the desired frequency; the phase locked loop must lock to the desired frequency within a certain time of interest; and the phase locked loop must yield consistent performance despite wide variation in device parameters which is inherent in integrated circuit processing. The phase locked loop employed in the illustrated embodiment, embodied in the digital clock recovery circuitry "dcr," satisfies all of these requirements.

In the illustrated embodiment, the forward link baseband data is encoded for direct sequence spread spectrum. In the illustrated embodiment, a data bit "1" is represented by a thirty-one chip sequence and a data bit "0" is represented by the logical inversion of the same thirty-one chip sequence.

The mode of operation of the device 12 is as follows. The chip periodically awakens from a low-current sleep mode in order to detect whether an incoming RF message is present. The clock recovery loop "dcr" is inactive in the low-current sleep mode. If a message is present, the message is tested to make sure it is a valid message from an interrogator. If the incoming signal passes these tests, the clock recovery loop is enabled, the clock is acquired, the message is processed, and a reply is sent. The device 12 then returns to sleep mode.

The digital clock recovery loop is illustrated by reference numeral 700 in FIG. 61. The digital clock recovery loop 700 comprises several sub-circuits. The digital clock recovery loop 700 includes a voltage controlled oscillator 702. The voltage controlled oscillator 702 has an output 704, and produces a square wave at output 704 having a frequency controlled by the voltage on an input control node. When the voltage on the control node is zero, the frequency at output 704 is at least one half of the final recovered frequency and not greater than the final recovered frequency. The output frequency rises monotonically, nearly linearly, as the control node voltage is increased. This is shown in FIG. 62. More particularly, FIG. 62 illustrates the frequency produced at the output 704 of the voltage controlled oscillator 702 relative to a voltage at the input control node.

The digital clock recovery loop 700 further includes a charge pump and loop filters which control the rate of change of the voltage on the control node of the voltage controlled oscillator. The charge pump and loop filters are designated in FIG. 61 with reference numeral 706.

The digital clock recovery loop 700 further includes a start-up circuit 708 which performs frequency detection when the voltage controlled oscillator first starts up and, in conjunction with the charge pump and loop filters 706, causes the voltage on the control node of the voltage controlled oscillator to change rapidly.

The digital clock recovery loop 700 further includes a state machine 710 which performs phase detection when the frequency of the voltage controlled oscillator is within a few percent of its final value and, in conjunction with the charge pump and loop filters, causes the voltage on the control node of the voltage controlled oscillator 702 to change slowly.

The only analog blocks .are the voltage controlled oscillator 702 and the charge pump. The rest of the circuits of the digital clock recovery loop are digital circuits which are easy to build at high yield in integrated circuit processes.

In the preferred embodiment, the voltage controlled oscillator 702 is the voltage controlled oscillator "dcr_vco" shown in the detailed schematic drawings, and has control nodes "OUTN" and "OUTP"; the state machine 710 is the state machine "dcr_statemachine" shown in the detailed schematic drawings; and the start-up circuit 708 is the start-up circuit "dcr_startup" shown in the detailed schematic drawings.

The digital clock recovery loop causes the frequency at the output of the voltage controlled oscillator to vary until a predetermined number of this clock fit within the time interval of an identifiable discrete segment of the incoming data. More particularly, in the illustrated embodiment, the digital clock recovery loop causes the frequency at the output of the voltage controlled oscillator to increase until exactly four cycles of the clock fit within the time interval of a single chip. In alternative embodiments, other integer numbers could be used. In the illustrated embodiment, a state machine having four states is employed to cause the frequency at the output of the voltage controlled oscillator to increase until exactly four cycles of the clock fit within the time interval of a single chip. A general description of the behavior of the control node voltage can be found above in the section titled Details of Lock Detection in a Digital Clock Recovery Loop.

What follows is a discussion of the operation of each block of the digital clock recovery loop. The start-up circuit 708 is show in FIG. 61. Although it may be simplified from the circuitry shown in the detailed schematics including "dcr_startup" shown in FIGS. 8.0501AA–BE, the theory of operation is the same.

The start-up circuit 708 includes a plurality of flip-flops 712 chained together, a plurality of flip-flops 714 chained together, and an exclusive-or gate 716. The exclusive-or gate 716 has an output connected to the input of the first of the flip-flops 714, has an input connected to the output of the last of the flip-flops 712, and has another input connected to the input of the same flip-flop 712. More particularly, in the illustrated embodiment, each flip-flop 712 and 714 is a D-type flip-flop and has a D input, a clock input, and a Q output. The D input of flip-flops 712 other than the first flip-flop is connected to the Q output of a previous flip-flop 712. The first flip-flop 712 is connected to the input data "Data In." The D input of flip-flops 714 other than the first flip-flop 714 is connected to the Q output of a previous flip-flop 714. The first flip-flop 714 is connected to the output of the exclusive-or gate 716. The clock inputs of the flip-flops 712 and 714 are all tied to the output 704 of the voltage controlled oscillator 702. Data is shifted from the D input of each flip-flop to the Q output of the same flip-flop on each clock pulse. Thus, the flip-flops 712 as a group define a shift register, and the flip-flops 714 as a group define a shift register.

The start-up circuit 708 further includes an AND gate 718 that has one input that is the output of the exclusive-or gate 716, has a second input that is the output of the second of the flip-flops 714, and defines an output "Puf1" (a first pump up fast output). The start-up circuit 708 further includes an AND gate 720 that has one input that is the output of the exclusive-or gate 716, has a second input that is the output of the third of the flip-flops 714, and defines an output "Puf2" (a second pump up fast output).

The start-up circuit 708 further includes a counter 722 that receives as inputs "Puf1" and "Puf2" and generates an output "SDD" (start data decode) when the output of the voltage controlled oscillator 702 is close to its final value.

The exclusive-or gate 716 in the center of the page generates a high output whenever there is a transition in the data as sampled by the clock signal output by the voltage controlled oscillator 702 output clock. Assume for discussion that data is latched into all flip-flops 712 and 714 on the falling edge of the clock. Puf2 goes high when three falling edges of the clock occur within one chip because the inputs of the AND gate are spaced apart by three flip-flops. Three falling edges of the clock occur within one chip when the frequency is between 75% and 100% of the final value. Puf2 goes high when two falling edges of the clock occur within one chip because the inputs of the AND gate are spaced apart by two flip-flops. Two falling edges of the clock occur within one chip when the clock frequency is 50% to 75% of its final value. This is shown on the waveform diagram of FIG. 63 for the case when the frequency is exactly 50%. Puf1 could be used to pump up the control node of the voltage controlled oscillator 702 rapidly. Puf2 could be used to pump up the control node of the voltage controlled oscillator 702 at a rate equal to that for Puf1 (as is shown in FIG. 61) or it could pump at a slower rate (as is done in the circuitry shown in the detailed schematics). As the clock frequency approaches 75% of final in the Puf1 case or 100% of final in the Puf2 case, pump up signals occur infrequently as error must accumulate over a long time to cause the appropriate number of clock edges to shift within a chip. This is used to detect when the clock frequency is close to its final value.

The counter 722 counts transition pulses until it is cleared by a Puf1 or Puf2 signal. If a predetermined large number of transitions are counted before a pump up occurs, a signal is asserted on a line SDD (start data decode). In the illustrated embodiment, if sixteen transitions are counted before a pump up occurs, a signal is asserted on line SDD. This indicates that the voltage on the control node of the voltage controlled oscillator is within a few percent of its final value, allowing data to be accurately recovered.

In the illustrated embodiment, the state machine 710 issues finer pump-up signals than the start-up circuit 708, and can also issue pump-down signals. In the illustrated embodiment, the start-up circuit 708 only issues pump up signals. The state machine 710 has as many states as the number of clock cycles which fit within one chip time. In the illustrated embodiment, the state machine has four states. The state machine 710 counts clock pulses and expects the data to transition at a count of one every time there is a transition. If the transition actually occurs at a count of four then the clock is too slow and a pump up is issued. If the transition actually occurs at a count of two then the clock is too fast and a pump down is issued. If the transition actually occurs at a count of three, it is not known whether the clock is fast or slow so no adjustment is made to the voltage controlled oscillator. A state diagram is shown in FIG. 64.

Design of a clocked sequential circuit is known in the art. See, for example, chapter 6 of Digital Logic and Computer Design by M. Morris Mano, 1979, Prentice-Hall, Inc. A typical design procedure involves describing circuit behavior using a state diagram (see FIG. 64), obtaining a state table (see FIG. 66), assigning binary values to each state (see FIG. 64), determining the number of flip-flops needed (see FIG. 65), choosing the type of flip-flops to be used (see FIG. 65), using Karnaugh maps or other simplification methods, deriving circuit output functions and flip-flop input functions (see FIGS. 67 and 68), and drawing the logic diagram. The numbers in parentheses in FIG. 64 are the binary state numbers. ENDT enables the sampling of the data (always at state two when no transition occurred). There are several ways to implement a circuit to perform functions of a state diagram. Assume that Q1 and Q1 are the binary state numbers in parentheses above (Q1 on the left, Q0 on the right), and that D1 and D0 are the next state values of Q1 and Q0, respectively. This is illustrated in FIG. 65. The flip-flop outputs Q0 and Q1 are the states. Then, a state table can be derived. This is shown in FIG. 66. Using Karnaugh maps (see FIGS. 67 and 68), minimum logic to perform the desired function can be derived. It should be noted, of course, that minimum logic need not be employed—logic involving an increased number of logic gates but performing the same desired function can also be employed. From the Karnaugh map shown in FIG. 67, the following equation can be derived:

$$D0=Q1+TX\cdot Q0+En\cdot TX$$

which can also be written as:

$$D0=[Q1'\cdot(TX\cdot Q0)'\cdot En\cdot TX)']'$$

where the symbol "+" represents a logical OR, the symbol "·" represents a logical AND, and the symbol "'" represents a logical NOT.

From the Karnaugh map shown in FIG. 68, the following equation can be derived:

$$D1=TX'\cdot Q1\cdot Q0'+En\cdot TX'Q0'$$

which can also be written as:

$$D1=[(TX'\cdot Q1\cdot Q0')'\cdot(En\cdot TX'Q0')']'$$

where the symbol "+" represents a logical OR, the symbol "·" represents a logical AND, and the symbol "'" represents a logical NOT.

Figure 69:
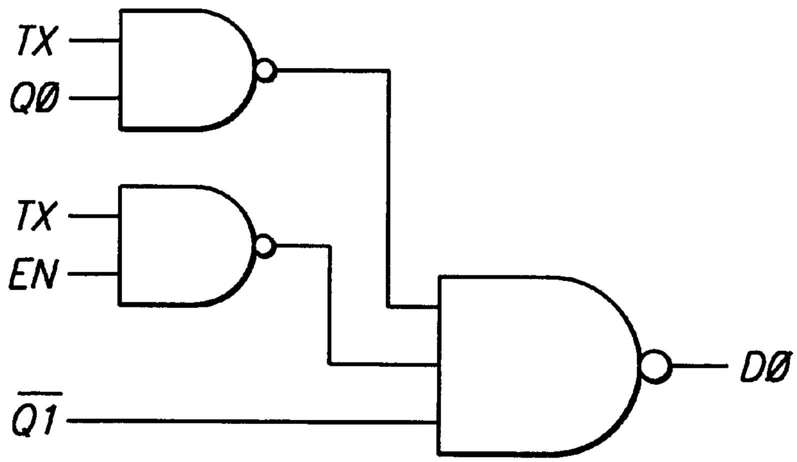
Figure 70:
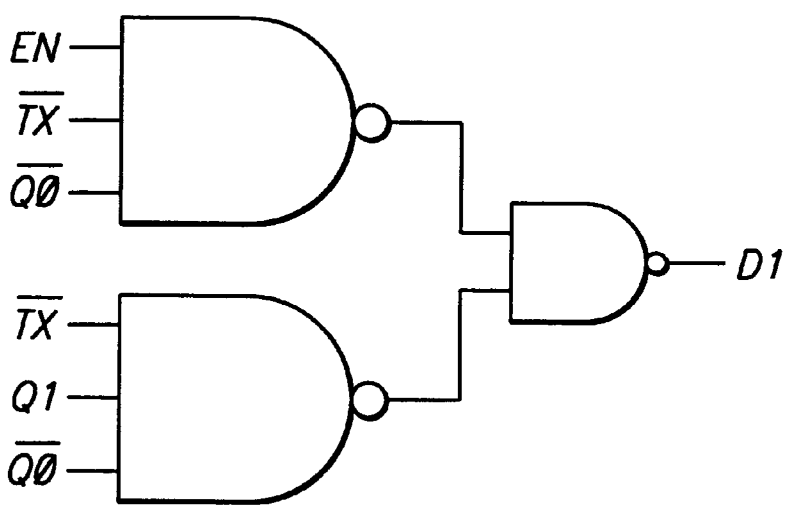

Logic to implement these equations is shown in FIGS. 69 and 70.

Paths shown in FIG. 64 are defined as follows:

ENDT=Q1'·Q0·TX'

PumpUpSlow=Q1·Q0'·TX; and

PumpDownSlow=Q1'·Q0·TX

Logic used to implement the state machine, in accordance with one embodiment of the invention, is shown in FIGS. 8.0502AA–CD.

A simplified timing diagram showing operation of the state machine is shown in FIG. 71. The crowding and separation of states in FIG. 71 is exaggerated to show the various modes of operation in a compact form. More particularly, it is highly unlikely that a pump down signal would be necessary so soon after a pump up signal as is depicted in FIG. 71.

The state machine is trying to fit four cycles of the output of the voltage controlled oscillator in one chip width. Referring simultaneously to FIGS. 71 and 64, starting at the first occurrence of state 3 in FIG. 71, there is no transition, so the state machine will proceed to state 4 on the next clock. At state 4, there is no transition, so the state machine will proceed to state 1 at the next clock. At state 1, there is a transition in the waveform. The state machine always proceeds to state 2 from state 1. At state 2, there is no transition. From state 2, the state machine proceeds to state 3. This cycle is repeated and these paths are followed unless the clock recovery loop drifts off frequency.

If the clock recovery loop drifts off frequency, other paths of the state diagram of FIG. 64 are followed. For example, if a transition is seen at state 4, the voltage controlled oscillator is oscillating too slowly, and a PumpUpSlow is issued. The state machine skips state 1 and goes to state 2.

If, after going from state 1 to state 2, a transition is seen, the voltage controlled oscillator is oscillating too fast. The state machine will go from state 2 to state 2 so that state 2 is now in the proper position.

If a transition is seen at state 3, the voltage controlled oscillator may either be oscillating too fast or too slowly, so no pump up or pump down signals are issued. Instead, the state machine proceeds to state 2.

The control functions performed by the start-up circuit and state machines can be used to control the frequency of any voltage controlled oscillator. The particular voltage controlled oscillator 702 that is employed in the illustrated embodiment is shown in FIGS. 8.0505AA–EF.

In the illustrated embodiment, the voltage controlled oscillator 702 includes a current controlled four-stage ring oscillator shown in the center of FIGS. 8.0505AA–EF. The frequency of oscillation is very much linearly proportional to the bias current flowing in each stage.

The voltage controlled oscillator 702 further includes an Operational Transconductance Amplifier shown on the left side of FIGS. 8.0505AA–EF. This Operational Transconductance Amplifier converts a voltage difference at its inputs to a current difference at its outputs. This Operational Transconductance Amplifier has a characteristic that is linear over a range of input voltage.

The composite circuit is a voltage controlled oscillator 702 with nearly linear operation about the operating point of 38.15 MHz. The circuit shown to the right in FIGS. 8.0505AA–EF converts the small signal output of the oscillator to full digital levels.

The input reference voltage is generated by a bandgap regulator and has a value of about 1.2 volts. The circuit is designed so that at nominal conditions the control node needs to pump to about equal to the reference voltage to oscillate at 38.15 MHz.

The start-up circuit requires that the oscillator start at greater than half frequency (approximately 19 MHz) and less than full frequency over all operating conditions and for all process variations. This oscillator start frequency is set by providing an offset current to the bias of the oscillator which is not controlled by the input voltage. In the illustrated embodiment, the range of allowed offset currents is 7.437 $\mu$A to 9.763 $\mu$A. A value of 8.2 $\mu$A was chosen. Thus, the oscillator start frequency will vary from about 20 MHz to 34 MHz.

The charge pump and loop filters 706 are shown in greater detail in FIGS. 8.0504AA–EE. The filter capacitors are shown on the right side of FIGS. 8.0504AA–EE. In the illustrated embodiment, the filter capacitors include a first group of ten capacitors, defining a total capacitance of 10 pF, and an second group of ten capacitors, defining a total capacitance of 10 pF. In FIGS. 8.0504AA–EE, the first group of ten capacitors is shown above the second group of ten capacitors. Other values or numbers are possible. In the illustrated embodiment, the lower group of capacitors is connected to the reference voltage input to the voltage controlled oscillator 702. The upper group of capacitors is connected to the control node input of the voltage controlled oscillator 702. The control node always starts at 0 Volts and is pumped up. The other (reference) side is always at the bandgap voltage.

The charge pump is shown in the center of FIGS. 8.0504AA–EE. In the illustrated embodiment, there are actually four charge pumps. The method employed is to steer a current to charge or discharge the 10 pF capacitor for a prescribed period of time (one cycle of the recovered clock, in the illustrated embodiment). The change in control voltage for a single pump is:

$$\Delta V=(I/C)\Delta t$$

The lower three of the illustrated charge pumps are controlled by the start-up circuit 708 and can only pump up. The upper pump is controlled by the state machine 710 and can pump up or down in fine steps. The step sizes are controlled by the current value which is set accurately using a bandgap regulator to generate a reference current and using current mirrors to set the pump current. The step sizes used in the illustrated embodiment are shown in FIG. 72. Of course, other step sizes can be employed, as desired, and various numbers of different sized steps can be employed.

The time used for the calculations for the coarse and medium cases is 40 ns, a typical value for the starting period of the oscillator. 26.2 ns is used for the medium fine and fine cases because these steps occur when the oscillator is close to its final frequency.

The course and medium steps are controlled by the Puf1 and Puf2 outputs of the start-up circuit. More particularly, in the illustrated embodiment, the course steps are controlled by the PumpUpFast output of the start-up circuit "dcr_startup" shown in the detailed schematic drawings, and the medium step is controlled by the PumpUpMed output of the start-up circuit "dcr_startup" shown in the detailed schematic drawings. The medium fine step is also controlled by the PumpUpMed signal but the step size is reduced when the SDD (start data decode) signal is asserted indicating the oscillator is within a few percent of its final value. The fine step is controlled by the state machine and is used to "close in" on the final value.

While this charge pump and loop filter configuration is advantageous for implementation on an integrated circuit, other configuration are possible. For example, simple RC filters can be employed.

Details of Transmit Frequency Derivation from Incoming Data

The illustrated embodiment has a loop filter including capacitors on respective control nodes "OUTN" and "OUTP" (shown in FIGS. 8.0504AA–EE) of the voltage controlled oscillator "vco." In the illustrated embodiment, the loop filter capacitor on the control node "OUTP" is defined by a plurality of capacitors in parallel, and the loop filter capacitor on the control node "OUTN" is defined by a plurality of capacitors in parallel. The voltage on the respective control nodes is indicative of the frequency at which the voltage controlled oscillator "vco" is oscillating. After an entire incoming message has been received by the receiver "rx," the control nodes and the capacitors on the control nodes are isolated from driving circuitry. The control voltage is thus stored in analog form on the capacitors, and the voltage controlled oscillator "vco" continues to oscillate at the recovered frequency. The length of time that the voltage stored on the capacitors is valid depends on leakage currents that can charge or discharge the capacitors over time.

In the illustrated embodiment, such leakage currents are minimized by minimizing n+ and p+ active areas on the control node, and by minimizing drain to source voltages on devices connected to the control nodes. The values for the respective capacitors are chosen, in conjunction with loop filter requirements, to hold the control voltages for as long as possible as required before the device 12 transmits a reply to the received radio frequency command. This amount of time is approximately several hundred milliseconds in the illustrated embodiment.

The output frequency of the voltage controlled oscillator can be multiplied up to generate a carrier frequency for the transmitter, as described elsewhere, or can be divided down to generate tones for FSK (frequency shift keyed) transmission or DPSK (differential phase shift keyed) transmission depending on what form of transmission is selected for the transmitter "tx."

In one embodiment, only one control node is employed; however, in the illustrated embodiment, a differential control node scheme is employed involving two control nodes "OUTN" and "OUTP." Therefore, in the illustrated embodiment, a capacitor is provided on each control node, and control voltages are stored in analog form on these two capacitors.

FIGS. 8.0504AA–EE provide a circuit drawing of the control voltage generator "dcr_vcocontrol." The control voltage generator shows the control nodes for the voltage controlled oscillator. The control voltage generator is a differential circuit. The control nodes are shown on the right edge of FIGS. 8.0504AA–EE as "OUTP" and "OUTN," where "OUTN" is actually tied to the band gap voltage, which is approximately 1.2 Volts. "OUTP" is the node that is pumped up to adjust frequency. as The control voltage generator includes step size generators shown on the left half of FIGS. 8.0504AA–EE. The steps are achieved by conducting a current to the capacitor on the control node for a prescribed length of time. For a large step, a large current is applied to this capacitor. For a small step, a smaller current is applied to this capacitor. The capacitor on the control node "OUTP" is defined by ten capacitors in parallel in the illustrated embodiment.

A similar capacitor, defined by ten capacitors in parallel, is provided on the other control node "OUTN."

Four different size currents are generated by fine, medium fine, medium, and coarse step generators "dcr_finestepgen," "dcr_medfinestepgen," "dcr_medstepgen," and "dcr_coarsestepgen" respectively. The currents are either steered to the control capacitor on the control node or away from the capacitor, depending on whether there is a pump up or pump down command.

FIGS. 8.050401AA–CK provide a circuit drawing showing construction details of the coarse step generator "dcr_coarsestepgen." The coarse step generator includes a plurality of current mirrors.

FIGS. 8.050402AA–CJ provide a circuit drawing showing construction details of the medium step generator "dcr_medstepgen." The medium step generator includes a plurality of current mirrors.

FIGS. 8.050403AA–BI provide a circuit drawing showing construction details of the medium fine step generator "dcr_medfinestepgen." The medium fine step generator includes a plurality of current mirrors.

FIGS. 8.050404AA–BB provide a circuit drawing showing construction details of a fine step controller "dcr_finestepctrl."

FIGS. 8.050405AA–EJ provide a circuit drawing showing construction details of the fine step generator "dcr_finestepgen."

FIGS. 8.0505AA–EF provide a circuit drawing of the voltage controlled oscillator "dcr_vco." The voltage controlled oscillator "dcr_vco" is a four stage ring oscillator with differential stages. The voltage controlled oscillator includes an OTA (operational transconductance amplifier) shown on the left side of FIGS. 8.0505AA–DE. The OTA gives a linear relationship between the voltage differential at its inputs and the current at its output. The voltage controlled oscillator further includes current mirrors which mirror the current at the output of the OTA to drive the voltage controlled oscillator to change its frequency. The previously discussed control nodes ("OUTN" and "OUTP" of FIGS. 8.0504AA–EE) are shown coming in on the left side FIGS. 8.0505AA–DE, labelled as "INN" and "INP." The voltage controlled oscillator further includes, at its output, a comparator type circuit that provides digital levels for the output of the voltage controlled oscillator "dcr_vco."

FIG. 8.0506AA–AB provide a circuit drawing of a clock generator "dcr_rxclkgen." Different frequencies are needed for different functions. The clock generator provides outputs at different frequencies. For example, the clock generator provides an output "PROCCLK" (for the processor), an output "CHIPCLK" (chip clock); and outputs "PLLCLKP" and "PLLCLKN" for the clock that drives the state machine. The clock generator "dcr_rxclkgen" has an input "LOWRATE" for low rate which is a signal indicative that the chip is in low rate and can expect data to come in at a chip rate of one-half the normal chip rate. The loop is adjusted in a manner such that the frequency of "FMASTER" does not change regardless of whether the chip is in high rate or low rate. However, the clock "CHIPCLK" for the integrated circuit 16 is half as fast in low rate, and it takes twice as long to get data in as it would to get the same amount of data in at the high rate.

FIG. 8.050601 provides a circuit drawing showing construction details of a flip-flop "dcr_rxclkgenff" included in the clock generator.

FIGS. 8.0507AA–AB provide a circuit drawing of a non-overlapping clock generator "dcr_clkgen." The non-overlapping clock generator receives as inputs true and compliment clock signals "ClkInP" and "ClkInN" and provides buffered true and compliment clock signals "ClkOut" and "ClkOutN." The non-overlapping clock generator buffers the true and compliment clock signals "ClkInP" and "ClkInN" in such a way that before "CLkOut" can go high, "ClkOutN" must be low, and then at the end of that cycle, before "ClkOutN" can go high, "ClkOut" must be low. Any overlap between the two clocks occurs when they are both low. They are never both high at the same time. This is quite commonly required in many circuits throughout the integrated circuit 16 where shift register type techniques are used, and one stage passes information to another. Non-overlapping clocks are required for such functions.

The circuit of FIGS. 6AA–EK further includes a transmitter "tx." The transmitter "tx" is capable of transmitting using different modulation schemes, and the modulation scheme is selectable by the interrogator. More particularly, if it is desired to change the modulation scheme, the interrogator sends an appropriate command via radio frequency. The transmitter can switch between multiple available modulation schemes such as Frequency Shift Keying (FSK), Binary Phase Shift Keying (BPSK), Direct Sequence Spread Spectrum, On-Off Keying (OOK), Amplitude Modulation (AM), and Modulated Backscatter (MBS).

The output responses are included in packets that contain, in order of transmission, a preamble, a Barker code, and the reply data.

In one embodiment, each bit of the radio frequency reply sent by the device 12 is modulated using a pseudo noise (PN) sequence for direct sequence spread spectrum communication. The sequence is generated in part by a linear feedback shift register "pngshr" having a plurality of registers "pngsreg." In one embodiment, the linear feedback shift register is in the form [5,2] which means that the input to the first register is the result of combining the output of the fifth register by the exclusive-OR with the output of the second register. This produces thirty-one states. In one embodiment, the linear feedback shift register is in the form [6,1] for a sixty-three chip sequence. In another embodiment, the linear feedback shift register is in the form [8,4,3,2] for a two hundred and fifty-five chip sequence. In a preferred embodiment, the shift register is selectable between multiple of the above forms. In the form [6,1], the input to the first of six registers is the result of combining the output of the sixth register by exclusive-OR with the output of the first register. In the form [8,4,3,2], the input to the first of eight registers is the result of combining the outputs of registers eight, four, three, and two by exclusive-OR. The sixty-three chip output sequence requires less time for signal synchronization than the two hundred and fifty-five chip sequence. However, the two hundred and fifty-five chip output sequence provides better performance in systems having poor signal to noise ratio.

FIGS. 8.06AA–ED provide a circuit drawing of the transmitter "tx." FIGS. 8.06AA–ED show a transmitter PLL "txpllfsyn," a test mode data selector "txdatasel," a BPSK modulation driver "txbpsk," a frequency doubler "txdoubler," a second frequency doubler "txdoubler2," a transmitter power amp "txpoweramp," a transmitter bias generator "txbias," and a modulated backscatter transmitter "txmbs." FIGS. 8.06AA–ED actually shows two different transmitters. Much of FIGS. 8.06AA–ED illustrates circuitry employed for an active transmitter which is used in accordance with an alternative embodiment of the invention, but not in accordance with the preferred embodiment. FIGS. 8.06AA–ED also illustrate the modulated backscatter transmitter "txmbs" that is employed in a preferred embodiment. The active transmitter will be discussed first.

In embodiment where the active transmitter is employed, the active transmitter operates by taking the "FMASTER" clock that was recovered from the incoming data stream and using a phase locked loop "txpllfsyn" (an analog phase locked loop in the illustrated embodiment) to multiply up the frequency. In the illustrated embodiment, the frequency is multiplied up by a factor of sixteen from 38 MHZ to 610 MHZ. The phase locked loop includes an oscillator that generates eight phases which are 450 out of phase with respect to each other. The eight phases generated by the oscillator are applied to first doubler circuits "txdoubler" and "txdoubler2" in order to generate the proper phased outputs at double the frequency that then again serve as inputs to the other doubler circuit. The active transmitter further includes a transmitter power amp "txpoweramp." The transmitter power amp includes the other doubler that receives the outputs of the first doubler circuits "txdoubler" and "txdoubler2." Capability for several different modulation techniques is provided for the active transmitter. One such modulation technique is BPSK where the phase of the carrier (2.44 GHz in the illustrated embodiment) is inverted to indicate a bit change. Another such modulation technique is amplitude modulation (AM). In the illustrated embodiment, 100% modulation, or on/off keying, is employed with the amplitude modulation.

FIGS. 8.0601AA–BB provide a circuit drawing of the transmitter phase locked loop "txpllfsyn." The phase locked loop "txpllfsyn" includes a voltage controlled oscillator "txvco" that receives an analog tune voltage and provides an output frequency in accordance with the analog tune voltage. The phase locked loop further includes a divider "txdivider" which receives the output signal of the voltage controlled oscillator "txvco" and divides the frequency of the output of the oscillator "txvco" by a factor of sixteen. It will be understood that this division ratio of sixteen is for an exemplary embodiment, and the scope of the present invention encompasses other division ratios. The phase locked loop "txpllfsyn" includes a phase/frequency detector "txpfdet." At the phase/frequency detector "txpfdet," the output of the divider "txdivider" is compared to the signal received at the reference input of the detector, which reference input, in accordance with one embodiment, is the signal "FMASTER" recovered from the incoming data stream. The phase/frequency detector "txpfdet" compares the fed back signal (i.e., having a frequency of the voltage controlled oscillator "txvco" divided by sixteen) with the signal received at the reference input and puts out a pump up signal "PU" or pump down signal "PD" in accordance with phase and frequency difference therebetween. The phase locked loop "txpllfsyn" further includes a charge pump "txchgpump." The pump up signal "PU" or pump down signal "PD" put out by the phase/frequency detector "txpfdet" drive the charge pump "txchgpump." The phase locked loop "txpllfsyn" further includes a loop filter "txloopfilter" that receives an output signal from the charge pump "txchgpump" and filters this output signal for providing the tune voltage for controlling the voltage controlled oscillator "txvco." The filter "txloopfilter" removes transients and establishes loop dynamics, i.e. responsiveness, of the resulting phase locked loop Again, the voltage controlled oscillator provides an output signal having a frequency proportional to the tune voltage received at its input. When the phase locked loop is locked, the frequency and phase of the signal fed back to the phase/frequency detector is equal to the frequency and phase of the reference input signal. Therefore, the output frequency of the voltage controlled oscillator "txvco" is equal to N times the frequency of the reference signal, where N is equal to the division factor of the divider. For the exemplary embodiment described above, N is equal to sixteen and the output frequency of the voltage controlled oscillator "txvco" is equal to sixteen times the frequency of the reference signal, e.g. 16×38.15 MHZ=610.45 MHZ. By providing various output taps distributed along a ring topology of the voltage controlled oscillator "txvco," output signals of different phase relationships (but of equal frequency) are obtained from the voltage controlled oscillator "txvco." In a preferred embodiment, eight separate output taps from the voltage controlled oscillator "txvco" provide eight different output signals having substantially 450 differences in phase therebetween, e.g., 0°, 45°, 90°, 135°, 180°, 225°, 270°, and 315°. Thus, in the illustrated embodiment, the voltage controlled oscillator "txvco" generates eight phases spaced 45°.

FIGS. 8.060101AA–BB provide a circuit drawing showing construction details of the phase/frequency detector "txpfdet." The phase/frequency detector puts out a pump up signal "PU" or pump down signal "PD", and drives the charge pump.

FIGS. 8.060102AA–BB provide a circuit drawing showing construction details of the charge pump "txchgpump." The charge pump drives the loop filter.

FIGS. 8.060103AA–CB provide a circuit drawing showing construction details of the loop filter "txloopfilter."

FIG. 8.060104AA–DC provide a circuit drawing showing construction details of the transmitter voltage controlled oscillator "txvco." The voltage controlled oscillator "txvco" generates eight phases spaced 45°.

Details of CMOS High Frequency VCO Stage

The voltage controlled oscillator "txvco" comprises a ring oscillator having four stages. FIG. 32 is a simplified schematic illustrating one stage 104. Four such stages are connected in a chain, with the outputs of the chain connected to the inputs of the chain, to define the ring oscillator. The stage 104 includes a p-channel transistor 105 having a gate defining a control node "V control," having a source connected to a supply voltage "V+," and having a drain; and a p-channel transistor 106 having a gate connected to the control node "V control," having a source connected to the supply voltage "V+," and having a drain. The stage 104 further includes an n-channel transistor 107 having a gate defining an input "IN P," a drain connected to the drain of the transistor 105 and defining a node "B," and a source; and an n-channel transistor 108 having a gate defining an input "IN N," a drain connected to the drain of the transistor 106 and defining a node "A," and a source. The stage 104 further includes an ideal current source 109 connected to the sources of the transistors 107 and 108 and directing current from the sources of the transistors 107 and 108 to ground. The stage 104 further includes a resistor 110 connected between the voltage "V+"and the drain of the transistor 107, and a resistor 111 connected between the voltage "V+"and drain of the transistor 108. The stage 104 further includes a source follower 112 including an n-channel transistor 113 having a gate connected to the node "A," having a drain connected to a supply voltage "V+," and having a source defining an output "OUT P"; and an ideal current source 114 connected to the source of the transistor 113 and directing current from the source of the transistor 113 to ground. The stage 104 further includes a source follower 115 including an n-channel transistor 116 having a gate connected to the node "B," having a drain connected to the supply voltage "V+," and having a source defining an output "OUT N"; and an ideal current source 117 connected to the source of the transistor 116. A source follower is a circuit where the signal at the source terminal of a transistor is approximately equal to the signal at the gate of the transistor. The source followers 112 and 115 are provided in the stage 104 to provide the necessary drive for the outputs "OUT P" and "OUT N" to drive a load. More particularly, the outputs "OUT P" and "OUT N" drive amplifiers that drive frequency doublers described elsewhere herein. Nodes "A" and B" are connected to another stage in the chain (e.g., by connecting the nodes. "A" and "B" to inputs "IN P" and "IN N" of a subsequent stage).

The ideal current source 109 drives a current "IBIAS," and the values of the resistors 110 and 111 and of "IBIAS" are chosen such that transistors 107 and 108 are in saturation. More particularly, the values of the resistor 110 and the current "IBIAS" are chosen such that the value of the resistance of resistor 110 multiplied by the current "IBIAS" is less than a maximum voltage (e.g. 800 mV) to cause saturation of transistor 107. In the illustrated embodiment, resistors 110 and 111 have the same resistance value. The resistors 110 and 111 are made from n-well, n+, p+, or polysilicon depending on the process used to manufacture the integrated circuit 16. Parasitic capacitance on nodes A and B is minimized by compact arrangement of the components of the stage 104. Computer software, such as from Cadence, can also be employed to reduce parasitic capacitance.

The stage 104 provides a differential amplifier capable of switching at a very high frequency. The switching frequency is adjustable by adjusting the voltage at control node "V control." More particularly, as the voltage at the control node "V control" decreases, the p-channel transistors 105 and 106 become more conductive, and there is less impedance between the supply voltage "V+," and the drains of the transistors 107 and 108. This provides for a faster switching rate. There is a linear change in frequency versus the voltage at the control node "V control" for at least some range of voltages.

FIGS. 8.06010401AA–DC provide a circuit drawing showing construction details of a stage "txvcostage" included in the transmitter voltage controlled oscillator. FIG. 8.0601040101 is a layout plot showing how the components of the stage 104 of FIG. 32 are laid out. More particularly, FIG. 8.0601040101 actually shows four stages. FIG. 8.0601040101 shows locations 400 defining resistors; a line 402 providing VREG (V+ of FIG. 32); locations 404 defining source followers of FIG. 32; a location 406 defining input "IN P" of FIG. 32; a location 408 defining input "IN N" of FIG. 32; locations 410 defining the n-channel differential pair and the current source of FIG. 32; locations 412 defining the p-channel devices of FIG. 32; a line 414 providing the control voltage "V control" of FIG. 32; and 915 MHZ option capacitors 416.

FIGS. 8.060105AA–DD provide a circuit drawing showing construction details of the divider "txdivider."

FIGS. 8.06010501AA–AB provide a circuit drawing showing construction details of a flip-flop "txdivtff" included in the divider.

FIGS. 8.0602AA–AB provide a circuit drawing showing construction details of a test mode data selector "txdatasel."

FIGS. 8.0603AA–AB provide a circuit drawing showing construction details of a BPSK modulation driver "txbpsk."

Details of Frequency Doubler

Analog multipliers are known in the art. An analog multiplier includes two inputs, and includes an output providing a signal that is representative of a multiplication of one of the inputs with the other of the inputs. One known analog multiplier is known as a Gilbert multiplier cell. For a detailed discussion of Gilbert cells, see *Four Quadrant Multiplier*, B. Gilbert, IEEE Journal of Solid State Circuits, 1968, pp. 365–373. Such Gilbert multiplier cells are also described in detail in *Analysis and Design of Analog Integrated Circuits*, Paul R. Gray and Robert G. Meyer, Third Edition, 1993, John Wiley & Sons, Inc., pp. 667–681. Such Gilbert multiplier cells include two cross-coupled, emitter-coupled pairs of bipolar junction transistors in series with an emitter coupled pair of bipolar junction transistors. A Gilbert multiplier cell employing bipolar junction transistors produces an output that is the hyperbolic tangent of two input voltages. This is because a characteristic of bipolar junction transistors is exponential non-linearity. If the input voltages are sufficiently low, the hyperbolic tangent function can be approximated as linear, and the circuit behaves as a multiplier which multiplies together the two input voltages.

The multiplier cell originally developed by Gilbert employed bipolar junction transistors. It is also known to employ MOS transistors to produce a Gilbert multiplier cell. See, for example, *Analog Integrated Circuits for Communication, Principles, Simulation and Design*, Donald O. Pederson and Kartikeya Mayaram, Kuwer Academic Publishers, Third Printing, 1994, pp. 431–433.

FIG. 34 illustrates a frequency doubler circuit 119 that includes a Gilbert cell 120. The Gilbert cell 120 includes a pair 122 defined by transistors 124 and 126. The Gilbert cell 120 further includes a pair 128 defined by transistors 130 and 132. The transistors 124 and 126 have sources that are connected together. Thus, the pair 122 is a source coupled pair. The transistors 130 and 132 have sources that are connected together. Thus, the pair 128 is a source coupled pair.

The transistors 126 and 130 have gates that are connected together to define a first input node. The transistors 124 and 132 have gates that are connected together to define a second input node. The transistors 124 and 130 have drains that are connected together, and the transistors 126 and 132 have drains that are connected together (shown as a criss-cross pattern in FIG. 34).

The Gilbert cell 120 further includes another pair 134 including transistors 136 and 138 having sources coupled together. Thus, the pair 134 is a source coupled pair. The pair 134 is in series with the pairs 122 and 128. More particularly, the transistor 136 has a drain connected to the sources of the transistors 124 and 126, and the transistor 138 has a drain connected to the sources of the transistors 130 and 132. The transistor 138 has a gate defining a third input node, and the transistor 136 has a gate defining a fourth input node. The Gilbert cell 120 further includes an ideal current source 140 driving current from the sources of the transistors 136 and 138 to ground. The frequency doubler 119 further includes a resistor 142 connected between the drain of the transistor 124 and a voltage, and a resistor 144 connected between the drain of the transistor 132 and the voltage. The resistors 142 and 144 define loads for current steering that produces output voltage swings.

For low amplitude signals, the Gilbert cell 120 provides an output between the drain of the transistor 124 and the drain of the transistor 132 that is an analog multiplication of a first input signal applied between the first and second input nodes, by a second input signal applied between the third and fourth input nodes.

It is known to use a Gilbert cell to multiply together sine waves of different phases to produce a doubled frequency (FIGS. 34 and 35). This is based on a known trigonometric relationship:

$$\sin 2\Theta = 2 \sin \Theta \cos \Theta$$

Signals that are 180° apart are applied to the first and second input nodes, and a phase shifter produces 90 shifted signals that are applied to the third and fourth input nodes. However, in such embodiments, an integrator is required, and the phase shifter is required to be feedback controlled, because slight errors in the required 90° phase shift would otherwise cause the output signals to have different average values and different amplitudes as shown in FIG. 33. FIG. 33 is a waveform diagram illustrating the effect of errors in frequency doubler circuits that necessitates correction, such as by using an integrator and feedback. FIG. 34 is a circuit schematic illustrating a frequency doubler circuit that employs an integrator and feedback to solve the problem illustrated in FIG. 33. FIG. 35 is a waveform diagram illustrating input and output waves created and employed by a frequency doubler circuit such as the one shown in FIG. 34.

It is desirable to avoid the need for feedback. Frequency multiplier circuits employing feedback are susceptible to being disturbed. For example, if substrate noise or an adjacent line switches and causes a shift at the integrator, the output will be distorted from the desired output until the integrator has a chance to recover. The integrator can take a long time to recover. Therefore, it is desirable to eliminate feedback loops from a frequency multiplier.

FIG. 36 is a circuit schematic illustrating a symmetric frequency doubler circuit 146 that does not require an integrator and feedback to solve the problem illustrated in FIG. 33. The frequency doubler circuit of FIG. 36 creates and employs waveforms such as those shown in FIG. 35.

The frequency doubler circuit 146 includes a first Gilbert cell 148, and a second Gilbert cell 150 coupled to the first Gilbert cell 148.

The first Gilbert cell 148 includes a pair 152 defined by transistors 154 and 156. The transistors 154 and 156 have sources that are connected together. Thus, the pair 152 is a source coupled pair. The Gilbert cell 148 further includes a pair 158 defined by transistors 160 and 162. The transistors 160 and 162 have sources that are connected together. Thus, the pair 158 is a source coupled pair.

The transistors 156 and 160 have gates that are connected together to define a first input node 163. The transistors 154 and 162 have gates that are connected together to define a second input node 165. The transistors 154 and 160 have drains that are connected together, and the transistors 156 and 162 have drains that are connected together (shown as a crisscross pattern in FIG. 36).

The Gilbert cell 148 further includes another pair 164 including transistors 166 and 168 having sources coupled together. Thus, the pair 164 is a source coupled pair. The pair 164 is in series with the pairs 152 and 158. More particularly, the transistor 166 has a drain connected to the sources of the transistors 154 and 156, and the transistor 168 has a drain connected to the sources of the transistors 160 and 162. The transistor 168 has a gate defining a third input node 169, and the transistor 166 has a gate defining a fourth input node 171.

The Gilbert cell 148 further includes an ideal current source 170 driving current from the sources of the transistors 166 and 168 to ground. The frequency doubler 146 further includes a resistor 172 connected between the drain of the transistor 154 and a voltage, and a resistor 174 connected between the drain of the transistor 162 and the voltage. The resistors 172 and 174 define loads for current steering that produces output voltage swings.

The second Gilbert cell 150 includes a pair 182 defined by transistors 184 and 186. The transistors 184 and 186 have sources that are connected together. Thus, the pair 182 is a source coupled pair. The Gilbert cell 150 further includes a pair 188 defined by transistors 190 and 192. The transistors 190 and 192 have sources that are connected together. Thus, the pair 188 is a source coupled pair.

The transistors 186 and 190 have gates that are connected together to define a first input node 193 of the second Gilbert cell 150. The transistors 184 and 192 have gates that are connected together to define a second input node 195 of the second Gilbert cell 150. The transistors 184 and 190 have drains that are connected together, and the transistors 186 and 192 have drains that are connected together (shown as a criss-cross pattern in FIG. 36).

The Gilbert cell 150 further includes another pair 194 including transistors 196 and 198 having sources coupled together. Thus, the pair 194 is a source coupled pair. The pair 194 is in series with the pairs 182 and 188. More particularly, the transistor 196 has a drain connected to the sources of the transistors 184 and 186, and the transistor 198 has a drain connected to the sources of the transistors 190 and 192. The transistor 198 has a gate defining a third input node 199, and the transistor 196 has a gate defining a fourth input node 201.

The Gilbert cell 150 further includes an ideal current source 200 driving current from the sources of the transistors 196 and 198 to ground.

The outputs of the second Gilbert cell are connected to the outputs of the first Gilbert cell. More particularly, the drain of the transistor 184 is connected to the drain of the transistor 154 and the drain of the transistor 192 is connected to the drain of the transistor 162.

The first input node 193 of the second Gilbert cell 150 is connected to the fourth input node 171 of the first Gilbert cell 148. The third input node 199 of the second Gilbert cell 150 is connected to the second input node 165 of the first Gilbert cell 148. The fourth input node 201 of the second Gilbert cell 150 is connected to the first input node 163 of the first Gilbert cell 148.

In operation, a first sinusoidal signal is applied to the second input node 165 of the first Gilbert cell 148. A second sinusoidal signal, 180° out of phase with the first sinusoidal signal, is applied to the first input node 163 of the first Gilbert cell 148 (and to the fourth input node of the second Gilbert cell 150). A third sinusoidal signal, 90° out of phase with the first sinusoidal signal, is applied to the second input node 195 of the second Gilbert cell 150. A fourth sinusoidal signal, 270° out of phase with the first sinusoidal signal, is applied to the first input node of the second Gilbert cell 150. This relationship of phases on the inputs to the first and second Gilbert cells causes the output to be symmetrical so that the problem of FIG. 33 is avoided without the need for feedback. Even with slight errors in phases between the input signals, a symmetrical output is produced.

Generally speaking, each Gilbert cell adds current from bottom transistors to top transistors through the resistor loads to form output voltages. In the illustrated embodiment, a phase arrangement applied to the upper Gilbert cell is generally reversed for the bottom Gilbert cell so undesirable offsets cancel each other.

In one embodiment, the second, third, and fourth input sinusoidal signals are derived from the first input sinusoidal signal using a simple s four stage differential oscillator.

A doubled frequency is thus obtained at the outputs, which are defined at the drain of the transistor 154 and the drain of the transistor 162, without the need for an integrator and feedback.

FIGS. 8.0604AA–AB provide a circuit drawing of the frequency doubler "txdoubler." The frequency doubler circuit "txdoubler" includes a doubler core "txfdbl" having two tiers of transistors. The two tiers of transistors are shown in FIGS. 8.060401AA–FE as being a top tier and a bottom tier. The frequency doubler requires different levels depending on whether the top tier of transistors or bottom tier of transistors are driven by a particular phase. The frequency doubler "txdoubler" therefore includes driver amplifiers "txfdbldrv" which provide that level shifting. There is no intended phase shift introduced by the driver amplifiers.

FIGS. 8.060401AA–FE provide a circuit drawing of the frequency doubler core "txfdbl." The frequency doubler core "txfdbl" includes level shifting circuitry. The level shift is a little level shift, and is accomplished by a resistor and capacitor shown at the top of the right stack (FIG. 8.060401AD). The level shift is performed in order to adjust output levels down in voltage because this frequency doubler core drives another frequency doubler.

FIGS. 8.0605AA–AB provide a circuit drawing of the frequency doubler "txdoubler2." The frequency doubler "txdoubler2" is substantially similar to the first frequency doubler "txdoubler." The main difference has to do with the bias arrangements for the driver amps and for the doubler core. In an alternative embodiment, the first and second frequency doublers "txdoubler" and "txdoubler2" are identical.

FIGS. 8.060501AA–CD provide a circuit drawing showing construction details of the doubler driver amplifier "txfdbldrv."

FIGS. 8.060502AA–CD provide a circuit drawing showing construction details of a second doubler driver amplifier "txfdbldrv2" included in the frequency doubler "txdoubler2." The second doubler driver amplifier "txfdbldrv2" include a bias diode. The doubler driver amplifier "txfdbldrv2" includes circuitry (the criss-cross configuration in FIGS. 8.060502AA–CD) where bi-phase (binary phase shift keying) modulation is performed. This is where a phase can be switched from one side to another by the state of two inputs "BPMODINP" and "PMODINN." Thus, a phase reversal can be accomplished in this circuit.

FIGS. 8.060503AA–FE provide a circuit drawing of a frequency doubler core "txfdbl2." The frequency doubler core "txfdbl2" is substantially identical to the frequency doubler core "txfdbl" except for the biasing transistors.

Details of Single Antenna Receiver and Active Transmitter

FIG. 50 provides a simplified circuit schematic showing the antenna 44 being shared by the active transmitter and the Schottky diode detector 84. The Schottky diode detector 84 was described above in detail in connection with FIG. 29, like reference numerals indicating like components.

The detector 84 includes a Schottky diode 86 having an anode connected to the antenna 44 and having a cathode. The detector 84 further includes an ideal current source 88 connected to the cathode of the Schottky diode 86 and driving current through the antenna and Schottky diode 86 in the direction from the anode to the cathode. The detector 84 further includes a capacitor 90 connected between the cathode of the Schottky diode 86 and ground and providing a radio frequency short to ground. The detector 84 further includes a capacitor 92 having a first terminal connected to the cathode, having a second terminal defining an output of the detector 84, providing an AC short to video frequency, and defining the output of the detector 84.

The active transmitter is described elsewhere herein, and is illustrated as a block 330 in FIG. 50.

The antenna is a loop antenna and has one end connected to a bias voltage (Vdd) and has another end connected to the anode of the Schottky diode 86.

The transmitter has an antenna output (or RF output) 332, and the detector 84 has an antenna input (or RF input) 334. In the illustrated embodiment, the integrated circuit 16 having the transmitter 330 and detector 84 includes a contact connected to the antenna output 332 and accessible from outside the IC package; and a contact connected to the antenna input 334 and accessible from outside the IC package. These contacts are connected together by a short outside the package. This provides for flexibility in that different antenna configurations are possible, separate antennas can be used for the detector 84 and transmitter 330, if desired, an external amplifier can be used to amplify the output of the transmitter 330, etc.

The detector and transmitter do not operate simultaneously.

In one embodiment, the integrated circuit 16 further includes a pull up transistor 336 connected to the cathode of the Schottky diode 86 and configured to connect the cathode to the bias voltage (Vdd) when the transmitter is operating. The pull up transistor 336 can be included if necessary so the detector does not interfere with the transmitter 330 while the transmitter 330 is transmitting.

By using a common antenna for the active transmitter and the Schottky diode detector, space savings are achieved.

The active transmitter 330 is shown in greater detail in FIG. 51. The active transmitter includes a differential pair 338 of transistors driven by the frequency doubler. The function of the differential pair 338 is to steer current to the antenna 44 or away from the antenna

44. If bi-phase modulation is employed, the differential pair 338 steers one phase or the other phase to the antenna 44. More particularly, if bi-phase modulation is employed, then a signal on line "ENABLEAM" (see FIGS. 8.06AA–ED, and 8.0605AA–AB to 8.0608AA–BB) is low and the leftmost of three current steering transistors (sources connected to the current source) is off because its gate is low. Current is then steered to the antenna by the transistor shown on the right. Its phase is determined in an earlier stage. The other phase is present in the middle transistor. When data is reversed the current phases switch sides in response to the earlier stage. If amplitude modulation is employed, the differential pair either sends current to the antenna 44, or is sends none to provide on/off keying. More particularly, in the amplitude modulation mode, a signal on line "ENABLEAM" is high and current is steered to the antenna by the transistor shown to the right if a signal on line "AMDATA" is high, and the current is steered to Vdd (not to the antenna) if the signal on line "AMDATA" is low.

FIGS. 8.0606AA–IE provide a circuit drawing of a transmitter power amplifier "txpoweramp." The transmitter power amplifier includes a frequency doubler, shown in the left half of FIGS. 8.0606AA–IE. In the illustrated embodiment, the frequency doubler receives inputs at 1.22 GHz, and provides outputs at 2.44 GHz. The transmitter power amplifier includes the differential pair of transistors, shown on the right side of FIGS. 8.0606AA–IE, driven by the frequency doubler. The differential pair steers current to the antenna or away from the antenna, as described above. If bi-phase modulation is employed, the differential pair steers one phase or the other phase to the antenna. If amplitude modulation is employed, the differential pair either sends current to the antenna, or it sends none to provide on/off keying.

FIGS. 8.0607AA–JJ provide a circuit drawing of a transmitter bias generator "txbias." The transmitter bias generator includes various current mirrors in order to provide the proper bias currents to the various blocks of the transmitter "tx."

Details of Single Antenna Receiver and Backscatter Transmitter

FIG. 52 provides a simplified circuit schematic showing an antenna 350 being shared by the backscatter transmitter and the Schottky diode detector 84, in a manner similar to the antenna sharing possibility described in connection with FIGS. 50–51. The Schottky diode detector 84 was described above in detail in connection with FIG. 29, like reference numerals indicating like components.

In the illustrated embodiment, the antenna 350 is a loop antenna and has one end connected to a bias voltage (Vdd) and has another end connected to the detector 84 via a detector input illustrated as RXANT in FIG. 52. For antenna sharing with a backscatter transmitter, capacitors 352 and 354 external of the integrated circuit 16 are employed, as illustrated in FIG. 52, to isolate the antenna from the backscatter antenna driver when the detector is using the antenna.

The detector and transmitter do not operate simultaneously.

By using a common antenna for the backscatter transmitter and the Schottky diode detector, space savings are achieved.

In an alternative embodiment shown in FIG. 53, a single antenna 350 is shared by the detector 94 (shown in FIG. 30 and described elsewhere herein) and a backscatter transmitter. An n-channel transistor 356 is provided having power electrodes connected to opposite ends of the antenna, and having a control electrode connecting to transmitter modulation circuitry. The control electrode is held low when the antenna is being used by the receiver.

FIGS. 8.0608AA–BB provide a circuit drawing of a modulated backscatter transmitter "txmbs." The modulated backscatter transmitter "txmbs" includes circuitry that creates non-overlapping drive signals. The modulated backscatter transmitter "txmbs" includes primary antenna ports "BS1" and "BS2." Each of these antenna ports is intended to be connected to one-half of a dipole antenna having a length appropriate for the transmission frequency. In the illustrated embodiment, the halves of the dipole antenna have respective sizes appropriate for 2.44 Ghz. The halves of the dipole antenna are not included on the integrated circuit 16, in the illustrated embodiment, but are instead provided "off chip." Other antenna arrangements are possible.

The modulated backscatter transmitter "txmbs" further includes an n-channel transistor marked 900 micron in FIGS. 8.0608AA–BB, and two n-channel pull-up transistors marked 100 micron and respectively connected between a voltage vdd! and the 900 micron transistor. When the gate of the transistor marked 900 micron is high, then the two dipole halves are shorted together with a fairly low impedance (e.g., on the order of 15 Ohms, plus any bond wire impedance that might be present depending on how the device is packaged). The antenna becomes substantially similar to a single half-wavelength antenna. In a backscatter mode, when the two halves of the antenna are shorted together, the antenna reflects a portion of the power being transmitted by the interrogator. In the other state, the gate of the 900 micron transistor is low. The 900 micron transistor is then off, but the two 100 micron transistors that pull up the voltage vdd! are on, lifting antenna ports "BS1" and "BS2" both up to a voltage of vdd! minus an n-channel Vt. The two antenna ports "BS1" and "BS2" are then isolated from each other by an open circuit. This isolation changes the radar cross-section of the dipole antenna dramatically from when the two halves are shorted together. The antenna becomes substantially similar to two quarter wavelength antennas. In a Backscatter mode, when the two halves of the antenna are isolated, the antenna reflects very little of the power transmitted by the interrogator.

The modulated backscatter transmitter "txmbs" further includes cross-coupled circuitry shown near the middle in FIGS. 8.0608AA–BB. The cross-coupled circuitry is provided to make sure that both the pull up transistors and the shorting device are not on at the same time.

The modulated backscatter transmitter "txmbs" further includes another antenna port "BS3" that is intended to be used when the integrated circuit 16 is packaged in the standard SOIC package. The antenna port "BS3" provides another option for configuring a backscatter antenna. The antenna port "BS3" supplies a one milliamp current and can drive an external PIN diode that would be situated between the two halves of the dipole antenna or any other suitable antenna. The other side of that external PIN diode can be returned to either the antenna port "BS1" or "BS2." Because PIN diodes are good shorting and opening devices for backscatter applications, the transmission range of a device 12 built with the integrated circuit 16 can be extended over the range that is obtained using only the internal circuitry of the it integrated circuit 16. This is at the expense of the need for an external component and an accompanying increase in cost of the device 12.

FIGS. 8.07AA–BB provide a partial circuit drawing illustrating a 915 MHZ transmitter "tx915" that can be included instead of the active transmitter described above. The transmitter "tx915" has one less stage of doubling. The chip rate also changes.

FIGS. 8.0701AA–CB provide a circuit drawing of a VCO stage modified for use with the 915 MHZ transmitter "tx915" by adding capacitors to the output. The modified VCO stage is manufactured by making a metal mask adjustment employed in an alternative embodiment of the invention.

FIGS. 9AA–CB provide a circuit drawing of the analog processor "analgproc." The analog processor "analgproc" includes a master bias source "mbs," voltage regulators "vrg" and "vrgtx," a bias OK circuit "biasok," an analog port current source "aportcs," an analog multiplexor decoder "asl," a random number clock generator "rcg" for the pseudo random number generator, a power up detector "pup," and an analog to digital (A/D) converter "ada new." The analog multiplexor decoder "asl" is an address selector used, in one embodiment, to choose from among various possible inputs to the analog to digital converter. The power up detector "pup" puts out a master reset pulse upon power up. The power up detector also puts out another pulse that lasts throughout a power up cycle in which the processor performs operations appropriate upon power up, the last operation being to reset the wake up pulse. The random number clock generator "rcg" generates random numbers for use in arbitration schemes and generates a pseudo-random sequence. The master bias source "mbs" includes a band gap regulator. The voltage regulators "vrg" and "vrgtx" generate supply voltages for various blocks of circuitry. The bias OK circuit "biasok" determines when the regulator voltage has reached a final level, and then enables the circuitry that is driven by the regulator.

Details of Low Battery Detection

The integrated circuit 16 includes a differential I/O op-amp or comparator comparing the voltage of the battery with a predetermined voltage (e.g., with band gap voltage). A low battery signal is generated if the voltage of the battery is less than the predetermined voltage. More particularly, one of the status registers is a battery status register and has a value indicating if the voltage of the battery is less than the predetermined voltage. The transmitter "tx" transmits the value of this battery status register via radio frequency when responding to commands from the interrogator. In the illustrated embodiment, a battery voltage detector is shown in FIGS. 16 (and in FIGS. 11 and 9.010304AA–BB); however, the battery voltage detector can be provided in a different location of the integrated circuit 16.

FIGS. 9.01AA–DH provide a circuit drawing of the analog to digital converter "ada_new." In the illustrated embodiment, the analog to digital converter is substantially disabled and is used only to provide a latch circuit for reading the low battery voltage detector. In a preferred embodiment, the analog to digital converter is used in connection with analog sensors and to provide alarm signals when thresholds are exceeded.

FIGS. 9.0101AA–CK provide a circuit drawing showing construction details of the differential I/O op-amp "dopamp" included in the analog to digital converter.

FIGS. 9.0102AA–DH provide a circuit drawing showing construction details of an analog divider (divide by two) "adaprescale" included in the analog to digital converter.

FIGS. 9.0103AJ–FP provide a circuit drawing showing construction details of a control PLA "adactl_new" included in the analog to digital converter circuit of FIGS. 9.01AA–DH.

FIGS. 9.010301AA–CC provide a circuit drawing showing construction details of a clock generator "adacgen_new" included in the control PLA.

FIGS. 9.010302AA–AB provide a circuit drawing showing construction details of a control output driver "adacdrv_new" included in the control PLA.

FIGS. 9.010303AA–AB provide a circuit drawing showing construction details of a control output driver "adacdrvn_new" included in the control PLA.

FIGS. 9.010304AA–BB provide a circuit drawing showing construction details of a data latch "adadlat_new" which is included in the control PLA and which is presently used as part of the battery voltage detector.

FIGS. 9.0104AA–DD provide a circuit drawing showing construction details of the analog bias circuit "adabias_new " included in the analog to digital converter.

FIGS. 9.02AA–DK provide a circuit drawing of a Vdd power up detector "pup" included in the analog processor. The power up detector puts out a master reset pulse upon power up. The power up detector also puts out another pulse that extends throughout a power up cycle while the processor performs a number of operation, the last one of which is to reset the wake up pulse. The power up detector uses a thermal voltage generator, which is a circuit such as is used for the low power current controlled oscillator, described above. The thermal voltage generator generates a small current. The power up circuit "pup" further includes current mirrors, and a capacitor illustrated near the top center of FIGS. 9.02AA–DK. The current mirrors mirror the small current generated by the thermal voltage generator. The mirrored current holds down one side of the capacitor illustrated near the top center of FIGS. 9.02AA–DK. When the power supply first rises from zero to its final value, whatever that might be (e.g., 3 Volts or 5 Volts), the capacitor couples up the bottom plate causing a signal to rise on a line "PWRUP." The small mirrored current then slowly discharges the bottom plate until "PWRUP" switches back low. A signal from before the fmal inverter producing "PWRUP" goes down to circuitry shown on the lower right of FIGS. 9.02AA–DK. That circuitry provides a hard pull down on the bottom of the capacitor to impede any switching back and forth. After the "PWRUP" pulse, the circuitry switches the bottom of the capacitor back down to ground much more rapidly than the small mirrored currents could. The circuitry then resets so that the only thing left holding the bottom of the capacitor low is the small current mirrored from the thermal voltage generator. The power up detector also generates another pulse on a line "WAKEUP" shown on the right of FIGS. 9.02AA–DK. This pulse goes high at the same time as the pulse on line "PWRUP" but does not come down at the same time. Instead, the pulse on the line "WAKEUP" does not come down until the processor issues a wake up acknowledge signal on line "WUACK." The processor does not issue the wake up acknowledge signal until completion of running of a wake up program stored in the ROM.

FIGS. 9.03AA–BB provide a circuit drawing of a master bias source "mbs" included in the analog processor. The master bias source "mbs" includes a band gap reference generator "mbs_bgr" to generate bias voltages for various circuits of the integrated circuit 16. The master bias generator includes a temperature compensated current generator "mbs_cur" that is employed in one embodiment of the invention, but is disconnected in the illustrated embodiment. The master bias source further includes a reference current generator "mbs_iref" that comprises current mirrors to replicate a reference current (e.g., 2.5 microAmps).

FIGS. 9.0301AA–DJ provide a circuit drawing showing construction details of a band gap reference generator "mbs_bgr" included in the master bias source. Band gap reference generators produce a reference voltage, and are known in the art. See, for example, *Analysis and Design of Analog Integrated Circuits*, Paul R. Gray and Robert G. Meyer, John Wiley & Sons. The reference voltage produced is approximately equal to the band gap voltage of silicon, which is approximately 1.2 Volts. A band gap reference generator generates a voltage output that is independent of power supply and temperature.

FIGS. 9.0302AA–DI provide a circuit drawing showing construction details of a temperature compensated current generator "mbs_cur" included in the master bias source.

FIGS. 9.0303AA–CF provide a circuit drawing of the reference current generator "mbs_iref" included in the master bias source. The reference current generator "mbs_iref" biases various circuits of the integrated circuit 16. The reference current generator "mbs_iref" includes current mirrors that replicate incoming current so that the reference current generator can supply the same value current to a number of different circuit blocks.

FIGS. 9.04AA–CE provide a circuit drawing of the voltage regulator "vrg" included in the analog processor. The voltage regulator includes an op-amp having an input receiving a reference voltage "VREF" (which is approximately 1.2 Volts). The voltage regulator further includes a large p-channel device driven by the output of the op-amp. In the illustrated embodiment, the p-channel device is made up of a plurality of r-channel devices connected together in parallel. The voltage regulator further includes an output node "VREG" driven by the plurality of p-channel devices. The voltage regulator further includes a resistor divider, shown along the middle of the right side of FIGS. 9.04AA–CE, connected to the output "VREG." The resistor divider includes a fifty percent point (having a voltage of half of the voltage at the output node "VREG") that is fed back to another input of the op-amp so that the voltage at the output node "VREG" is required to be two times the input voltage "VREF" to complete the feedback. In the illustrated embodiment, a number of individual regulators are employed in order to isolate power supplies to different areas of the circuit. However, in alternative embodiments, a reduced number of voltage regulators are employed.

FIGS. 9.05AA–FE provide a circuit drawing of the voltage regulator "vrgtx" included in the analog processor. The voltage regulators "vrg" and "vrgtx" generate supply voltages approximately equal to two times band gap voltage (about 2.4 Volts) for various blocks of circuitry. The voltage regulator "vrgtx" provides substantially the same output voltage as the voltage regulator "vrg"; however, it has a bigger drive capability. The voltage regulator "vrgtx" is connected to the active transmitter which requires a lot of current.

FIGS. 9.0501AA–CD provide a circuit drawing showing construction details of an operational amplifier without compensation "opampnc" included in the voltage regulator.

FIGS. 9.06AA–DD provide a circuit drawing of a bias OK detector "biasok" included in the analog processor. The bias OK detector puts out a signal indicating that regulator voltage going to the receiver is at or near full level. The bias OK detector includes a voltage detector. A delay is built in so that adequate time is allowed. The bias OK detector allows biases to stabilize before releasing the clock recovery circuit and the wake up test logic.

FIGS. 9.07AA–EG provide a circuit drawing showing construction details of an analog port current source "aportcs" included in the analog processor. The analog port current source "aportcs" provides a current which can be used to bias sensors external to the integrated circuit 16. The value of the current supplied by the analog port current source "aportcs" is selected from several available values by a radio frequency command. In the illustrated embodiment, the analog port is not employed. However, in alternative embodiments, an analog port is used.

FIGS. 9.08AA–CC provide a circuit drawing showing construction details of an analog multiplexer decoder "asl" included in the analog processor. The analog multiplexer decoder "asl" is an address selector. More particularly, in a preferred embodiment, the analog multiplexer decoder "asl" is used to choose from among various possible analog inputs to the analog to digital converter.

The random number clock generator "rcg" for the pseudo random number generator is shown in greater detail in FIGS. 9.09AA–BB. The random clock generator generates random numbers for use in the arbitration scheme of the protocol to sort between multiple responding devices 12.

Details of Low Power Pseudo Random Number Generator

The device includes a random clock generator "rcg" including a linear feedback shift register "rcg_osc" that has a plurality of stages and that generates a pseudo-random sequence. The random clock generator "rcg" includes an oscillator "rcg osc" that supplies clock signals to the linear feedback shift register. The device includes a low current generator, such as a thermal voltage generator, to drive the oscillator that supplies clock signals to the linear feedback shift register. The shift register has two modes of operation;

namely, a low power mode, and a high power mode. The random clock generator includes current mirrors referenced to the low current generator. In the low power mode, the current to each stage of the shift register is limited by the current mirrors. In the high power mode, the current mirror device gates are driven to full supply voltages. This allows the shift register to operate at a higher frequency appropriate for shifting the random number into the processor.

This technique is illustrated, with reference to an inverter, in a simplified schematic in FIG. 37. FIG. 37 shows a circuit including series connected p-type transistors 210 and 212, and series connected n-type transistors 214 and 216 which are connected in series with the p-type transistors 210 and 212. The transistors 210, 212, 214, and 216 are connected between a positive voltage "V+"and ground. The transistor 210 has a gate connected to a voltage "V BIAS P" and the transistor 216 has a gate connected to a voltage "V BIAS N." When "V BIAS N" and "V BIAS P" are controlled by a low current current mirror (low power mode), the turn-on voltages of transistors 210 and 216 are small and current through inverter transistors 212 and 214 is limited. When "V BIAS N" is pulled to "V+" and "V BIAS P" is pulled to ground, the inverter operates at full speed.

FIGS. 9.09AA–BB provide a circuit drawing showing construction details of the random clock generator "rcg" included in the analog processor. The random clock generator "rcg" includes a low power oscillator and bias generator "rcg_osc." The random clock generator "rcg" further includes the linear feedback shift register "rcg_sreg." The random clock generator "rcg" further includes a clock generator "rcg_clkgen" which generates non-overlapping versions of the clock which drives the linear feedback shift register "rcg_osc." The linear feedback shift register "rcg_osc" generates the pseudo-random sequence. The random clock generator further includes circuitry (shown below the linear feedback shift register in FIGS. 9.09AA–BB) for switching between clock schemes. This circuitry includes an n-channel device and a p-channel device (shown as circles with x's through them in FIGS. 9.09AA–BB) allowing connection or blocking connection between the input and the output of the devices. The alternate clock sources are state one "S1," state three "S3," and phase two "P2" from the processor clock. The shift register is operable in a high power mode and in a very low power mode. When the processor wants a random number from the shift register "rcg_osc," these clocks are used and the shift register is operated in the high power mode to shift eight bits at a time in serial fashion into the processor. A total of sixteen bits are transferred, so two transfers of eight bits each take place. At other times, the shift register is in the very low power mode and is driven by the clock generated by the low power oscillator. In this manner, the shift register "rcg_osc" sequences through its pseudo-random sequence continuously in the background until the shift register is called upon to provide a number.

FIGS. 9.0901AA–CH provide a circuit drawing showing construction details of the linear feedback shift register "rcg_sreg" included in the random clock generator. In the illustrated embodiment, the linear feedback shift register "rcg_sreg" is a [17,3] shift register having an output in register seventeen. The input to the first register is the exclusive-or of registers seventeen and three. The linear feedback shift register "rcg_sreg" includes seventeen stages, so it produces a sequence of $2^{17}$-1. Therefore, the odds of two devices 12 being at the same place in the sequence are low.

FIGS. 9.090101AA–CC provide a circuit drawing showing construction details of a shift register zero bit "rcg_sregbit0" included in the linear feedback shift register. This bit is different from others so that it can is power up in a particular state. The shift register will function to deliver a sequence of pseudo-random numbers as long as all registers are not allowed to go to zero. Therefore, the zero bit "rcg_sregbit0" of the shift register is altered to guarantee that it will be a one on power up. The shift register bit "rcg_sregbit0" shown in FIGS. 9.090101AA–CC also includes a series of n-channel and p-channel devices to limit current in the logic gates. When the random clock generator is in the low power mode, the bias voltages on these series devices allow only very small currents; however, when the random clock generator is operating in the high power mode (when the processor is shifting in a random number) then these nodes are driven to full supply. A line "BIASN" will be driven to Vdd, and a line "BIASP" will be driven to ground. Then the logic of the random clock generator operates in a normal mode.

FIGS. 9.090102AA–BB provide a circuit drawing showing construction details of a shift register bit "rcg_sregbit" included in the linear feedback shift register.

FIGS. 9.0902AA–FL provide a circuit drawing showing construction details of the low power oscillator and bias generator "rcg_osc" included in the random clock generator. The low power oscillator includes a thermal generator, as in previously described circuitry. The low power oscillator and bias generator "rcg_osc" further includes bias voltage generators shown in the middle and at the bottom in FIGS. 9.0902AA–FL. The bias voltage generator shown at the bottom in FIGS. 9.0902AA–FL includes extra transistors to allow switching between high and low power states.

FIGS. 9.0903AA–CC provide a circuit drawing showing construction details of a clock generator "rcg_clkgen" included in the random clock generator.

The PN processor "pnproc" shown in FIGS. 6AA–EK is the spread spectrum processing circuit 40 shown in FIG. 5. The PN processor "pnproc" performs spread spectrum processing. Spread spectrum modulation is described elsewhere. The PN processor "pnproc" is shown in greater detail in FIGS. 10AA–DD.

The PN processor "pnproc" shown in FIGS. 10AA–DD includes a digital PN correlator "dcorr." The correlator receives a data stream on line "RXCHIPS" that comes from the receiver. The correlator has a thirty-one chip register and performs a comparison of the chip pattern of the incoming data stream with the expected thirty-one chip pattern. When there is a total or near match, the correlator "dcorr" puts out a high signal (a one) on line "RXDATA." When there is a nearly total mismatch, the correlator "dcorr" puts out a low signal (a zero) on line "RXDATA." Every thirty-one chips, "RXDATA" either changes state or does not change state, depending on whether the PN sequence was inverted or not inverted (i.e., depending on whether a zero or one was defined by the thirty-one chip sequence). The output of the correlator "dcorr" on line "RXDATA" is a sequence of true, non-encoded, data bits of ones and zeros.

The PN processor further includes a PN lock detector "pnlockdet." The lock detector is a circuit that determines whether a preamble is present. In the illustrated embodiment, the preamble is all zeros. Therefore, the lock detector "pnlockdet" determines whether or not a certain length of zeros have occurred in a row. In the illustrated embodiment, the lock detector "pnlockdet" determines whether or not four zeros occurred in a row. The lock detector "pnlockdet" has an output that is connected to the serial input output circuit "sio" in the processor, and enables the processor to look for the Barker or start code.

The PN processor further includes a clock "pngclk." The clock "pngclk" is a clock generator that is based on a clock signal "CHIPCLK" produced by the digital clock and data recovery circuit "dcr." The clock "pngclk" puts out non-overlapping true and compliment versions of the clock and these are used to drive circuitry in the PN processor.

The PN processor further includes a shift register "pngshr." The shift register is a block of logic that can be used to generate a thirty-one chip sequence, a sixty-three chip sequence, and a two hundred and fifty-five chip sequence. A thirty-one chip sequence is always used for receiving, but for transmitting multiple selections are available. In the illustrated embodiment, the integrated circuit 16 is wired to allow a selection between thirty-one and sixty-three chips. In alternative embodiments, it can be wired to allow a selection between thirty-one and two hundred and fifty-five chips, or between thirty-one and sixty-three chips. In the receive mode, the PN sequence is not used explicitly, except that the middle chip and the last chip in the sequence are detected, and those signals are used by circuitry labelled "Bit Rate Clock Generator" in FIGS. 10AA–DI to generate a bit rate clock for the transmitter and receiver. Thus, the output of this shift register "pngshr" is used to generate a bit rate clock, on line "TRCLK." In the transmit mode, if a modulation scheme has been selected that uses spread spectrum encoding, the output of this shift register is used to encode the data.

The PN processor further includes a differential and PN encoder "dpenc." The differential encoder performs differential encoding and PN encoding. The differential encoder includes an input connected to a line "TXDATA." The data on line "TXDATA" is differential encoded by the differential encoder, if differential encoding is selected. Both polarities of differential encoding are provided for and are selected depending on the desired modulation scheme. The differential and PN encoder can also impress the PN code on the data "TXDATA" if this is selected.

The PN processor further includes a PSK/FSK generator "fskgen." In the illustrated embodiment, PSK (phase shift keying) is performed by the PSK/FSK generator "fskgen." In an alternative embodiment, FSK (frequency shift keying) is performed by the PSK/FSK generator "fskgen." The generator "fskgen" has both a last chip complement output "FSKLASTCHIP" and a mid chip complement output "FSKMIDCHIP." These outputs are connected to the bit rate clock generator and override the outputs from the PN generator shift register "pngshr". The bit rate clock generator then generates the appropriate bit rate clock.

The PN processor further includes D type flip-flops "pnddff," one of which is included in the bit rate clock generator.

The PN processor further includes circuitry shown on the lower right in FIGS. 10AA–DD that provides for test modes. This circuitry provides a way to bring a modulating signal for the transmitter out to a digital pad "DIGTXOUT" depending on whether an enable signal is placed on an enable pin "DIGTX." The enable signal on enable pin "DIGTX" is also used, in connection with a signal on line "ForceRXON" to force the receiver to receive in a continuous fashion. The output of the receiver is routed to a line "TESTRXDATA" and that signal is routed to a digital output pad (the digital pad "DIGTXOUT" in the illustrated embodiment).

FIGS. 10.01AA–DJ provide a circuit drawing showing construction details of the digital PN correlator "dcorr" included in the PN processor. The correlator "dcorr" includes a bias generator "dcor bias" that generates bias currents for other circuitry included in the correlator. The correlator "dcorr" further includes a shift register "dcorr_sreg." The shift register "dcorr_sreg" performs a chip by chip comparison between the incoming data stream and the expected thirty-one chip PN sequence. For each chip that agrees, the shift register "dcorr_sreg" puts out a current on a line "Iagree." For each chip that is in disagreement, the shift register "dcorr_sreg" puts out a current on a line "Idisagree." Currents are added for each of the thirty-one chips on these lines "Iagree" and "Idisagree." The PN correlator "dcorr" further includes two comparator structures shown in the middle of FIGS. 10.01AA–DJ as an upper comparator and a lower comparator. The upper comparator has current biasing defining a threshold, and the lower comparator has current biasing defining a threshold. When a sufficient number of currents flow from the shift register "dcorr_sreg" into the "Iagree" line to overcome the threshold set by the current biasing in the upper comparator, a one is detected, and the circuit puts out a digital one. If, on the other hand, the currents in the "Idisagree" line are high enough to overcome the threshold set by the current biasing in the lower comparator, a zero is detected, and the circuit puts out a digital zero. In other cases, the output does not change. The correlator further includes circuitry shown on the right of FIGS. 10.01AA–DJ that synchronizes the data stream out of the correlator and into other information processing circuitry.

FIGS. 10.0101AA–BG provide a circuit drawing showing construction details of the PN correlator shift register "dcorr_sreg" included in the PN correlator. The shift register "dcorr_sreg" performs a chip by chip comparison between the incoming data stream and the expected thirty-one chip PN sequence. For each chip that agrees, the shift register "dcorr_sreg" puts out a current on a line "Iagree." For each chip that is in disagreement, the shift register "dcorr_sreg" puts out a current on a line "Idisagree."

FIG. 10.010101 provides a circuit drawing showing construction details of a PN correlator bit "dcorr_bit" included in the PN correlator shift register.

FIG. 10.01010101 provides a circuit drawing showing construction details of a shift register cell "dcorr_sregbit" included in the PN correlator bit.

FIGS. 10.0102AA–CN provide a circuit drawing showing construction details of a correlator bias generator "dcorr_bias" included in the PN correlator.

FIGS. 10.02AA–BE provide a circuit drawing showing construction details of a PN lock detector "pnlockdet" included in the PN processor. The PN lock detector "pnlockdet" detects the preamble by counting. For example, in the illustrated embodiment, the PN lock detector "pnlockdet" determines that a preamble has been received if the lock detector counts four consecutive zeros in a row. If the PN lock detector does not achieve the four consecutive zeros, it resets and starts counting again.

FIGS. 10.0201AA–AB provide a circuit drawing showing construction details of a counter bit "lockcounterbit" included in the PN lock detector.

FIGS. 10.03AA–AB provide a circuit drawing showing construction details of the PN generator clock "pngclk" included in the PN processor. The PN generator clock is a non-overlapping clock generator.

FIGS. 10.04AA–CE provide a circuit drawing showing construction details of a PN generator shift register "pngshr" included in the PN processor. The PN generator shift register has select lines so that various sized PN sequences can be generated (e.g. thirty-one, sixty-three, or two hundred and fifty-five chip sequences). The PN generator shift register also includes circuitry for generating mid chip and last chip signals "MIDCHIP" and "LASTCHIP" which are used for generating the bit rate clock.

FIG. 10.0401 provides a circuit drawing showing construction details of a PN generator shift register cell "pngsreg" included in the PN processor.

FIGS. 10.0402AA–CB provide a circuit drawing showing construction details of a PN generator shift register summer "pngssum" included in the PN generator shift register.

FIG. 10.05 is a circuit drawing showing construction details of a PN controller D type flip-flop "pnddff" included in the PN processor.

FIGS. 10.06AA–DH provide a circuit drawing showing construction details of differential and PN encoder "dpenc" included in the PN processor. The differential and PN encoder includes circuitry shown on the left in FIGS. 10.06AA–DH which performs differential encoding. The circuitry encodes data such that zeros in the incoming data cause the output to transition from either zero to one or one to zero, and ones in the incoming data cause the output not to transition. Other forms of differential encoding can be performed. For example, the circuitry can encode data such that ones in the incoming data cause the output to transition from either zero to one or one to zero, and zeros in the incoming data cause the output not to transition. A selection of one of these two forms of differential encoding is performed by placing a high or low signal on a selection line "DIFFSEL." Whether or not differential encoding takes place at all is also selectable. The differential and PN encoder further includes circuitry shown on the right in FIGS. 10.06AA–DH which PN encodes the data, if spread spectrum modulation is selected.

FIGS. 10.07AA–CD provide a circuit drawing showing construction details of a PSK/FSK generator "fskgen" included in the PN processor. The PSK/FSK generator "fskgen" takes as its input a clock which runs at the chip rate (9.538 MHz in the illustrated embodiment). The PSK/FSK generator "fskgen" generates a tone for phase shift keying (e.g., 596 kHz in the illustrated embodiment). The PSK/FSK generator "fskgen" further includes circuitry shown at the bottom in FIGS. 10.07AA–CD which switches phase according to the input data. In other words, this circuitry compliments ones to zeros, and zeros to ones according to input data. If PSK or FSK is not selected, data passes through the PSK/FSK generator unaltered.

FIGS. 10.0701AA–AB provide a circuit drawing showing construction details of a FSK counter bit "fskcbit" included in the PSK/FSK generator.

FIGS. 11AA–AB provide a circuit drawing of a battery I/O buffer "batalg" included in the integrated circuit 16. In one embodiment, battery voltage is compared to band gap voltage (produced by the band gap reference generator) using an op-amp. In one embodiment, the battery I/O buffer "batalg" is used to connect a voltage to the analog to digital converter; however, in the illustrated embodiment, this function is performed by a circuit "tsn." The circuit "tsn" includes an enable line, and includes a resistor divider. When an enable signal is placed on the enable line, the resistor divider is tapped, and the output of the resistor divider goes to an op-amp for comparison with band gap voltage.

In order to detect a low battery voltage, circuitry is provided which defines what is a low voltage. The lowest possible value at which an indication is given that the battery voltage is low is the value at which the integrated circuit 16 begins to fail to operate properly. However, in a preferred embodiment, an extra margin is provided so that there is time to replace the battery or replace the device before the integrated circuit 16 fails. For example, in one embodiment, the margin is 0.1 Volts. The circuitry "tsn" is therefore set up with a voltage divider having a tap compared to the band gap voltage. The voltage divider has resistor values selected so that when battery voltage is at the margin (e.g. 0.1 Volts) above the lowest possible value, the tap in the voltage divider has a voltage slightly below the band gap voltage (e.g., 1.2 Volts).

FIGS. 12AA–AB provide a circuit drawing of a digital I/O pad buffer "paddig" included in the integrated circuit 16. The digital I/O pad buffer is both an input and output buffer. The I/O pad buffer "paddig" has an input "DPAD" which is connected to a bond pad of the integrated circuit 16. Data entering the pad buffer "paddig" from the input "DPAD" passes through an ESD protection device "esdl" and then passes on to whatever circuit for which it is an input (there are many such pad buffers "paddig" in the illustrated embodiment). Data to be output via the pad buffer "paddig" comes into the pad buffer "paddig" via a line "DOUT" along with an enable on line "ENABLE." The pad buffer "paddig" includes a static pull down device shown on the far right in FIGS. 12AA–AB. The pad buffer "paddig" further includes n-channel and p-channel transistors shown in the right in FIGS. 12AA–AB proximate the static pulldown device. If an enable signal is present on line "ENABLE" and "DOUT" is high, the two p-channel devices will turn on and pull the output pad "DPAD" high. If "DOUT" is low, the two n-channel devices will turn on and pull the output pad "DPAD" low. The pad buffer "paddig" further includes circuitry providing for gradual pulling high or pulling low to reduce transient currents. This is because a user may connect the pad to drive a heavy load.

FIG. 13 provides a circuit drawing of a digital input pad buffer "padigin" included in the integrated circuit 16. FIG. 13 shows the input portion only of the pad buffer "paddig."

FIG. 14 provides a circuit drawing of an analog I/O pad buffer "padalg" included in the integrated circuit 16. In one embodiment, the analog I/O pad buffer is used to connect an external sensor to the analog to digital converter.

Details of RF Selectable Return Link

The return link configuration logic "rlconfig" provides for user customization of operation of the transmitter "tx." Various customizations are possible. For example, the transmitter "tx" is selectable as operating in a backscatter transmit mode, or an active transmit mode in response to a command from the interrogator 26. This is shown in FIGS. 21 and 22. FIG. 21 is a simplified circuit schematic illustrating a transmitter "tx" switchable between an active mode and a backscatter mode, and employing separate antennas As1 and As2 for the active mode and the backscatter mode, respectively. If the active mode is selected, the micro controller connects the antenna As1 to transmit the output of the transmitter, using switch S1. If the backscatter mode is selected, the micro controller 34 connects the antenna As2 to transmit the output of the transmitter, using switch S2. In an alternative embodiment, shown in FIG. 22, the transmitter "tx" is still switchable between an active mode and a backscatter mode, but employs the same antenna 46 for both the active mode and the backscatter mode.

If the backscatter mode is selected, the interrogator 26 sends a continuous unmodulated RF signal while the transmitter "tx" transmits a response to a command from the interrogator 26. The clock recovered from the incoming message is used to derive a subcarrier for the transmitter "tx." In the illustrated embodiment, the subcarrier for the transmitter "tx" is a square wave subcarrier. The response to the interrogator is modulated onto the square wave subcarrier by the device 12 using a selected modulation scheme. For example, the response can be modulated onto the subcarrier using Frequency Shift Keying (FSK), or Binary Phase Shift Keying (BPSK).

If the active transmit mode is selected, the transmitter 32 is selectable as using amplitude modulation, or bi-phase (Binary Phase Shift Keying) modulation. The transmitter 32 is selectable as using differential coding, and/or spread spectrum coding. There are various combinations of options that can be selected through the commands that are sent to the integrated circuit 16 by the interrogator 26. The transmitter 32 is selectable as using the thirty-one chip spread spectrum sequence, or a narrow band.

These options provide for a wide range of possible applications or uses for the integrated circuit 16, and provide for the possibility of using different schemes in an application for different purposes. For example, an active transmit can be selected for certain purposes, while a backscatter transmit can be selected for different purposes.

FIGS. 15AA–BC provide a circuit drawing of return link configuration control logic "rlconfig." The return link configuration control logic "rlconfig" has inputs "TXSEL0," "TXSEL1," and "TXSEL2." The values on these inputs are defined by a radio frequency command sent by the interrogator. These inputs "TXSEL0," "TXSEL1," and "TXSEL2" are connected to the outputs of an output register "oreg" included in the processor. The return link configuration logic takes each possible combination of inputs "TXSEL0," "TXSEL1," and "TXSEL2" (there are a total of 2×2×2=8 possible combinations) and asserts appropriate control signals to enable the desired return link configuration. The signals being controlled by the return link configuration control logic "rlconfig" are: "ENDIL" for enabling the data interleaver; "PNOFF" for selecting whether or not PN encoding is employed for data transmitted by the device 12; "DIFFSEL" for selecting which polarity of differential encoding is used for transmitted data; "DIFFON" for selecting whether or not differential encoding is employed for transmitted data; and "ENFSK" for selecting FSK (or PSK in an alternative embodiment) for transmitted data; "BSCAT" for enabling backscatter for transmitted data; and "ENABLEAM" enables amplitude modulation.

The integrated circuit 16 further includes a number of sensors, such as sensors "batalg," "tsn," and "mag," in the embodiments where an A/D converter is included in the analog processor "anlgproc." The sensor "batalg" is a battery voltage detector, the sensor "tsn" is a temperature sensor, and the sensor "mag" is a magnetic sensor. These sensors will be connected to the A/D converter in the analog processor "anlgproc" in one embodiment of the invention. In one embodiment, one or more of these sensors are not included or not used.

Using such sensors, the device 12 can monitor things such as its own battery voltage, its temperature and detect the presence of a magnetic field. There are various possible uses for information sensed by such sensors. For example, events can be counted so that, depending on the user's application, the user can determine whether or how many times a certain item was exposed to temperature above or below a certain value (e.g., to determine likelihood of spoilage or damage). Alternatively, the user can determine whether or how many times a certain item was exposed to a magnetic field of a certain value (e.g., when passing a certain location).

FIGS. 16AA–EH provide a circuit drawing showing construction details of the temperature sensor "tsn." The temperature sensor "tsn" was designed to put out a voltage that is linearly proportional to temperature. In the illustrated embodiment, the circuit "tsn" has been reconfigured for use as a low battery voltage detector.

FIGS. 16.01AA–DI provide a circuit drawing showing construction details of an operational amplifier "opamp" included in the temperature sensor "tsn."

FIGS. 17AA–BB provide a circuit drawing of a magnetic field sensor "mag." The magnetic field sensor senses magnetic fields.

FIGS. 18AA–AB provide a circuit drawing showing a chip bypass capacitor "bypcap3." The capacitor "bypcap3" is a integrated circuit decoupling capacitor between Vdd and ground.

FIG. 19AA–EK provide a circuit drawing of a semiconductor integrated circuit in accordance with an alternative embodiment of the invention. The integrated circuit of FIGS. 19AA–EK is similar to the integrated circuit shown in FIGS. 6AA–EK, like components having like component names, except that the integrated circuit of FIGS. 19AA–EK has no ROM, and is intended to be connected to an external ROM. This is useful for test purposes.

FIGS. 20AA–DF provide a circuit drawing of a data processor "dataproct3" to be used in the integrated circuit of FIG. 19 in place of the data processor "dataproc." The data processor "dataproc_t3" has an interface to external ROM.

FIGS. 20.01AA–CB provide a circuit drawing of an interface "extrom" to an external ROM.

FIGS. 20.0101AA–BB provide a circuit drawing of external ROM " control logic "extromctl" included in the interface "extrom."

FIG. 20.0102 is a circuit drawing of an external ROM address interface "extromad" included in the interface "extrom."

FIGS. 20.0103AA–AC provide a circuit drawing of a digital I/O pad buffer "paddigt3" included in the interface "extrom." The digital I/O pad buffer "paddigt3" is the pad driver for the external ROM.

FIG. 20.0104 is a circuit drawing of an external ROM databus interface "extromdb" included in the interface "extrom."

FIGS. 6AA–EK also illustrate bonding pads "PAD AA," and "PAD A," "PAD B," "PAD C," "PAD D," PAD E," "PAD F," "PAD G," "PAD H," PAD I," "PAD J," "PAD K," "PAD L," "PAD M," "PAD N," "PAD 0," "PAD P," "PAD Q," "PAD R," "PAD S," PAD T," "PAD U," PAD V," "PAD W," "PAD X," "PAD Y," and "PAD Z," which are provided around the edge of the die of integrated circuit 16. In the illustrated embodiment, the integrated circuit 16 includes a standard 20 lead SOIC package; however, any appropriate integrated circuit package can be employed.

Connections to these pads are brought out of the package and are accessible to the user. In this way, the user can somewhat tailor the function of the integrated circuit 16 to their application. In one embodiment, however, the entire device 12 is encapsulated in a housing such as that shown in FIG. 3.

The pads P and Q are digital port data and clock pads, and work together to provide a serial input or output, or a digital connection outside the integrated circuit. For example, if desired, data can be transmitted to the integrated circuit 16 via radio frequency, and a response can be put out on the digital port data pad, or vice versa.

The pad R is a chip enable pad, and prevents wake up to look for an incoming radio frequency signal. There are some applications or uses where the user knows that there will be certain periods of time when no valid radio frequency signals will be presented to the integrated circuit 16. The user will want to prevent the integrated circuit 16 from leaving the sleep mode so that power can be saved, and the life of the battery 18 can be extended.

The pad S is a test mode pad for testing. When the integrated circuit 16 is powered on (i.e., when power is first applied), if that pad is held high then the micro controller 34 goes into a self-test mode. After the self-test, if the pad S is no longer held high, the integrated circuit 16 goes to the sleep mode, and periodically awakens to look for valid radio frequency signals, as it normally would. This pad S is useful to the manufacturer of the integrated circuit 16, such as for testing prior to packaging the die of the integrated circuit 16 in the housing of the integrated circuit 16.

The pad T is a digital transmit pad, and the pad U is a digital transmit data pad. These pads are useful for testing. They allow the integrated circuit 16 to operate in its intended manner, except that, if the pad T is held high, data from the integrated circuit 16 is brought out as a digital signal on the pad U instead of being transmitted via radio frequency using transmitter “tx.”

If the pad I is held high, data to the integrated circuit 16 is brought in as a digital signal on the pad H instead of being received via radio frequency using receiver “rx”. Details of the logic associated with this function are included in the FIG. 8.01 in connection with lines “DIGRX” (associated with pad I) and “DIGRXDATA” (associated with pad H). This logic includes the NAND gates and invertors shown leading from the lines “DIGRX” and “DIGRXDATA” to a line “Dataln.”

These pads T, U, I, and H provide for testing of most functions of the integrated circuit 16 without the need to use high frequency radio signals. High frequency radio signals may not always be convenient in a testing lab. The pads T and U do not provide for testing of some functions relating to radio frequency transmission, and the pads I and H do not provide for testing of some functions relating to radio frequency reception (e.g., operation of the Schottky detector). These pads T, U, V, and H do provide for testing of the spread spectrum processing circuit 40, and for processing of protocol commands described in the appended microfiche. This allows everything but operation of radio frequency transmitter 32 and receiver 30 to be checked prior to proceeding with that radio frequency testing. It also provides a function for the user, in that the integrated circuit 16 does not necessarily need to be used as a radio frequency identification device. The integrated circuit 16 has a receiver, and a transmitter, and it can be used for various purposes, such as an actuator or beacon. If it is not necessary to have a radio transmission or reception of data, either one or both form of data can be passed directly through the pads in digital form.

Note that there are separate enables T and I associated with transmitting or receiving digital data. For example, if the digital transmit pad T is taken high, then the transmitter “tx” will not cause a radio frequency signal to travel to antenna 46 but instead outgoing responses will come out on the pad U. However, the receiver “rx” will operate normally unless the digital receive pad I is taken high.

The pad V is a TX clock pad, or transmit clock pad. Pad V was intended to be an external input that could be used for a clock for the transmitter 32 instead of the clock recovered from the incoming signal. In some applications, it may be necessary to have a clock that is more stable than the recovered clock, and the pad V provides a way for the user to supply such a clock. For example, the user may connect a crystal oscillator, external to the integrated circuit 16, and that way achieve a very stable carrier frequency for the transmitter “tx.” In the illustrated embodiment, pad V has been reconnected to provide a signal which can be used to activate an external, high performance radio.

The pads Y, Z, AA, A, and D are antenna pads for connecting the receiver 30 and transmitter 32 to the shared antenna 14 or the multiple antennas 44 and 46. In the preferred embodiment, circuitry that interfaces these pads is physically located on the die next to these pads. More particularly, the microwave outputs of the transmitter 32 are arranged on the die so as to be next to (in close physical proximity to) the appropriate bond pads.

The pad B is a test RX or test receive pad, and the pad C is a test TX or test transmit pad. Because the integrated circuit 16 is usually in the sleep mode, but wakes up briefly to look for a valid incoming radio frequency signal, and then goes back to sleep, it can be difficult to test the receiver “rx” and the transmitter “tx.” Therefore the pads B and C provide for forcing on the receiver “rx” and transmitter “tx,” respectively, such as for testing. If a high signal is applied to the pad B, this forces the receiver “rx” to remain on. Similarly, if a high signal is applied to the pad C, this forces the transmitter “tx” to remain on.

If the pad B is used to force the receiver on in order to exercise the circuitry, such as through clock recovery, an input radio frequency signal is required at the appropriate frequency (e.g., 2.45 GHz) modulated with the spread spectrum code.

The pad E is a RX input or receive input pad. This pad is connected to a side of the Schottky detector where the base band signal is available. This pad is provided for test purposes and to allow the use of a high-performance Schottky diode external to the integrated circuit 16.

The pad G is a VSS A pad, or analog VSS pad. The pad G is a connection to a ground bus that only goes to the analog circuitry.

Other pads J, K, L, M, N, 0, and W are voltage supply or voltage drain pads. (Vss or Vdd).

Protocol

A description of a protocol which can be employed by the device 12 for the commands, replies, and status information is contained in a manual titled “Micron RFID Systems Developer’s Guide.” This manual relates to a device for use with an “AMBIT” (TM) brand tracking system as well as to the device 12. Also relevant is U.S. Pat. No. 5,500,650 to Snodgrass et al., titled “Data Communication Method Using Identification Protocol,” incorporated by reference.

Examples of commands that can be sent from the interrogator 26 to the device 12 are as follow:

Identify

An Identify function is used when attempting to determine the identification of one or more of the devices 12. Each device 12 has its own identification number TagId. It is possible that the interrogator will receive a garbled reply if more than one tag responds with a reply. If replies from multiple tags are received, an arbitration scheme, discussed below, is used to isolate a single device 12.

ReadAnalogPort

In one embodiment, a ReadAnalogPort function is provided which returns the voltage (eight-bit value) of a selected analog port on a device 12.

ReadDigitalPort

A ReadDigitalPort function returns data read from a serial port of a device 12.

ReadTagMemory

A ReadTagMemory function returns data from a user accessible portion of memory included in a device 12.

ReadTagStatus

A ReadTagStatus function returns system information about a specified device 12. For example, in response to this command, the device 12 will transmit a confirmation of its TagId, a tag revision number, the low battery status bit, and other information.

SetAlarmMode

In one embodiment, a SetAlarmMode function is provided which is used to determine if a set point has been exceeded on an analog port of the device 12 (e.g., if a sensor senses a condition exceeding a predetermined threshold). There are three alarm modes: SET_HIGH_BAND_ON_ALARM, SET_LOW_BAND_ON_ALARM, and SET_STATUS_REG_ON_ALARM.

The SET_HIGH_BAND_ON_ALARM mode sets a device 12 to a low data band, and clears a bit in the device's status register indicative of an alarm threshold being exceeded. When a set point (threshold) is violated, the device 12 will switch from the low data band to a high data band.

The SET_LOW_BAND_ON_ALARM mode sets a device 12 to a high data band, and clears a bit in the device's status register indicative w8 of an alarm threshold being exceeded. When a set point (threshold) is violated, the device 12 will switch from the high data band to the low data band.

The SET_STATUS_REG_ON_ALARM mode does not change data bands, but will result in a bit ALARM_THRESHOLD_EXCEEDED in the status register being set if the set point is violated.

SetMemoryPartition

A SetMemoryPartition function defines (initializes) a block of user memory in a device 12 for memory partition. After being initialized, a partition may be used to store data using a function WriteTagMemory. Data may be read from the partition using a function ReadTagMemory. The number of partitions available on a device 12 can be determined using the ReadTagStatus function.

WriteAccessId

A WriteAccessId function is used to update an access identification AccessId for one of the memory partitions.

WriteDigitalPort

A WriteDigitalPort function is used to write data to the synchronous serial port of a device 12.

WriteTagId

A WriteTagId function is used to update the TagId of a device 12.

WriteTagMemory

A WriteTagMemory function is used to write to the user memory space UserMemory of a device 12.

WriteTagsRegs

A WriteTagsRegs function is used to update selected or all registers of a device 12 including registers TagControlReg, LswTagId, TagStoredinterrId, TimedLockoutCounter, and DormantCounter for a range of RandomValueIds. This command can be used, for example, to disable a device 12. If desired, the transmitter of a device 12 can be disabled while the receiver of that device 12 is left functional. This is accomplished using bits KILL_TAG_0 and KILL_TAG_1 in a register TagControlReg.

WriteTagRegsRandIdRange and WriteTagRegsTagIdRange

WriteTagRegsRandIdRange and WriteTagRegsTagIdRange functions are used to update registers of a group of devices 12. The WriteTagRegsTagIdRange function updates selected or all registers, including registers TagControlReg, LswTagId, TagStoredInterrId, TimedLockoutCounter, and DormantCounter, for a range of TagIds.

Examples of interrogator commands are as follows:

GetCrntAntenna

A GetCrntAntenna function returns the current antenna set used to communicate with a device 12.

GetCrntRetries

A GetCrntRetries function returns the number of times a command was re-transmitted during the last tag-specific command.

GetInterrStats

A GetInterrStats function returns record-keeping parameters if the interrogator performs this function.

GetReplyStats

A GetReplyStats function returns values that are specific to the last tag-specific reply if the interrogator processes this information.

SetInterrRegs

A SetInterrRegs function is used to set various communication parameters on an interrogator. Not all of the parameters are used on all interrogators.

SetInterrTest

A SetInterrTest function is used during testing. This function should not be called in normal operation.

SetTimeouts

A SetTimeouts function is used to set the system watchdog timers.

A convenience command is described as follows:

IdentifyAll

An IdentifyAll function returns the number of devices 12 found within the system's communication range. The IdentifyAll reply parameters include the TagId and RandomValueId for each device 12 that is identified.

Figure 56B:
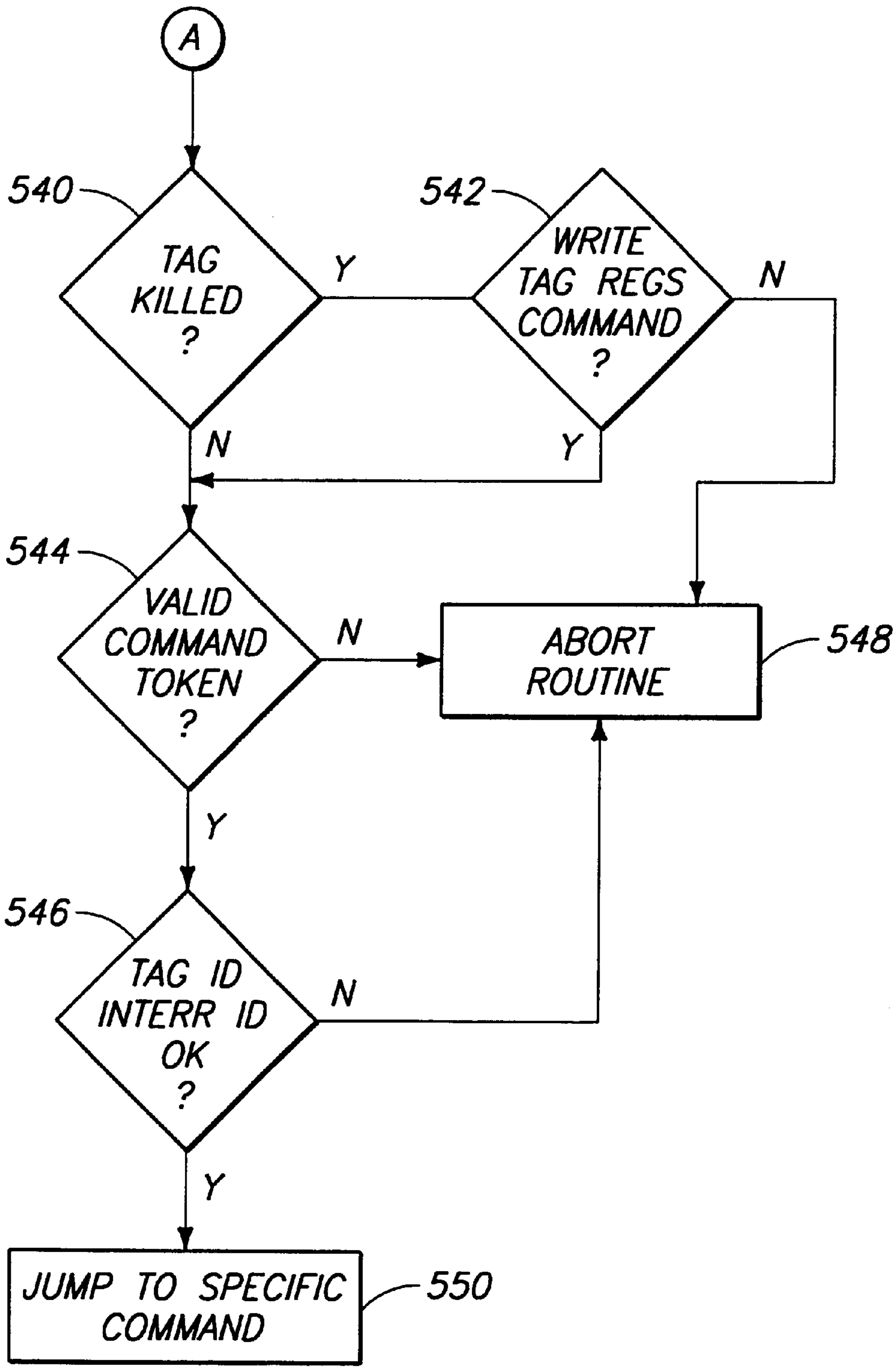
Figure 51A:
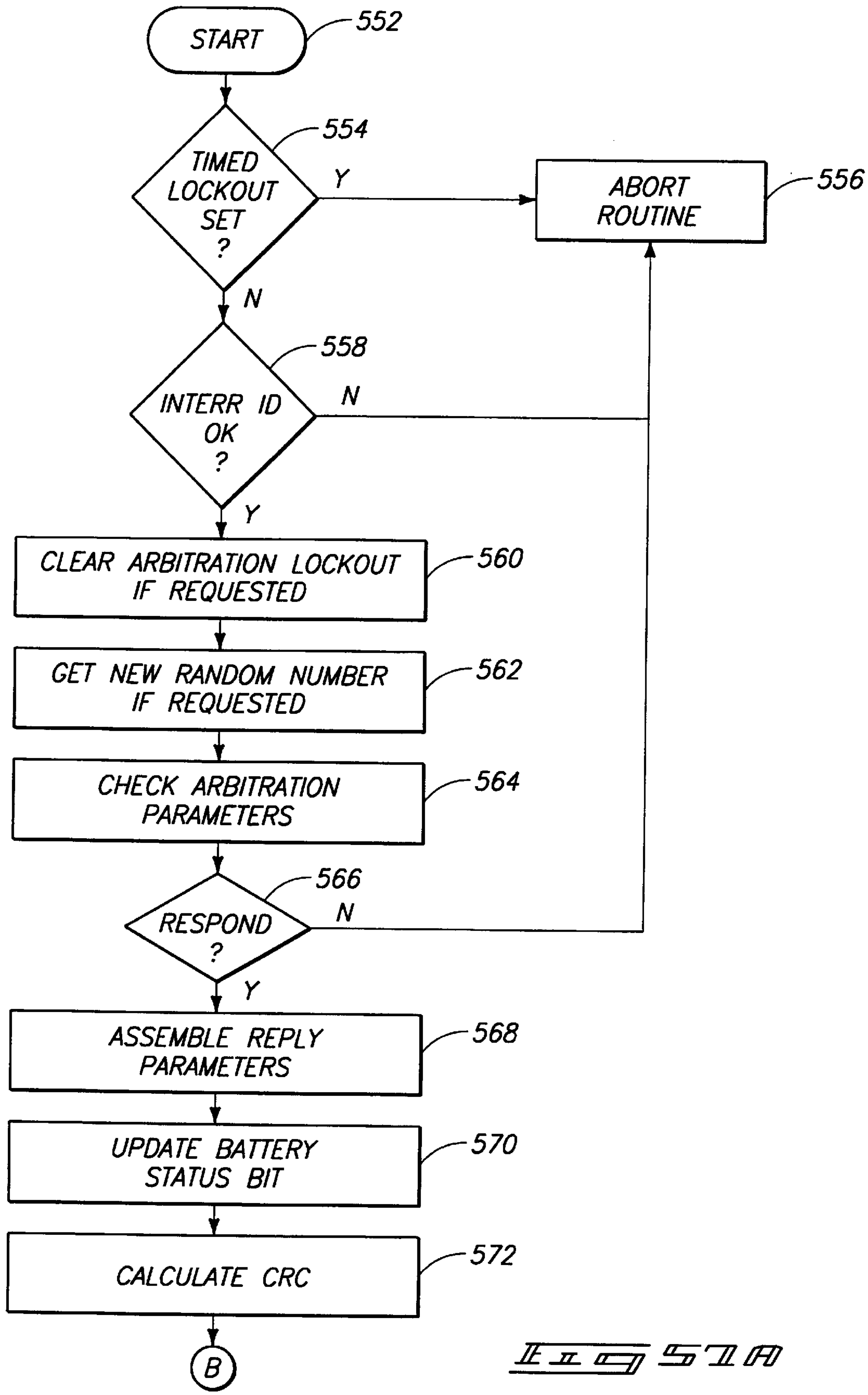

The sequence of steps performed by a device 12 upon receipt of an Identify command from an interrogator will now be provided, reference being made to FIGS. 55–57.

FIG. 55 illustrates top level steps, held in ROM, performed by the data processor of the device 12 upon wake up (upon leaving a sleep mode 500) for any reason. The sleep mode is described above.

At step 502, a determination is made as to whether the device 12 is in a test mode. Test mode is enabled by holding a special pin high at power up time. If so, the data processor proceeds to step 504; if not, the data processor proceeds to step 506.

At step 504, a test routine is performed. The current test routine checks the Rom, RAM, processor registers, and the timed lockout timer. After performing step 504, the data processor proceeds to step 500 (the device 12 returns to the sleep mode).

At step 506, a determination is made as to whether the device 12 is being powered up according to the status of a signal provided by a power up detector circuit. If so, the data processor proceeds to step 508; if not, the data processor proceeds to step 510.

At step 508, a power up routine is performed which initializes the wakeup timer, sets up the control register, and clears the RAM. After performing step 508, the data processor proceeds to step 500 (the device 12 returns to the sleep mode).

At step 510, a determination is made as to whether a protocol request has been issued. If so, the data processor proceeds to step 512; if not, the data processor proceeds to step 514.

At step 512, the data processor executes a command processing routine. The command processing routine is described in greater detail below, in connection with FIGS. 56A–B. After performing step 512, the data processor proceeds to step 500 (the device 12 returns to the sleep mode).

At step 514, a determination is made as to whether an alarm timer request has been issued. This occurs once each minute. If so, the data processor proceeds to step 516; if not, the data processor proceeds to step 500 (the device 12 returns to the sleep mode).

At step 516, the data processor performs an alarm timer routine, which in one embodiment allows a selected analog input to be compared against a threshold. The results of the comparison can be used to set a bit and optionally cause the chip to change data bands.

The command processing routine 512 is illustrated in greater detail in FIG. 56.

At step 518, high signals are placed on lines SIOENABLE and RPENABLE to enable the serial input output block "sio" and to enable radio frequency communications. After performing step 518, the data processor proceeds to step 520.

At step 520, a determination is made as to whether RFDET is high indicating that an RF signal is still present at the receiver input. If so, the data processor proceeds to step 522; if not, the data processor proceeds to step 524.

At step 524, the command processing routine is aborted, and the device 12 returns to the sleep mode.

Steps 522, 526, 528, and 532 are used to determine whether a first byte of a command is received within a predetermined amount of time after the chip wakes up and successfully acquires the clock signal from the incoming preamble.

At step 522, a counter is initialized according to the wakeup interval selected. After performing step 522, the data processor proceeds to step 526.

At step 526, a determination is made as to whether the counter has counted down to zero. If so, the data processor proceeds to step 524; if not, the processor proceeds to step 528.

At step 528, a determination is made as to whether the first byte of a valid incoming radio frequency signal has been detected. If so, the processor proceeds to step 530; if not, the processor proceeds to step 532.

At step 532, the counter is decremented. After performing step 532, the data processor proceeds to step 526.

At step 530, the data processor reads in a command string from the serial input output block "sio" and stores the command string in random access memory. The serial input output block "sio" controls transfer of an incoming radio frequency message from the receiver to the data processor. After performing step 530, the data processor proceeds to step 534.

At step 534, the high signals on lines RFENABLE and SIOENABLE are cleared. After performing step 534, the data processor proceeds to step 536.

At step 536, the receiver is turned off in order to conserve =7 power. After performing step 536, the data processor proceeds to step 538.

At step 538, a determination is made using CRC as to whether transmission occurred without errors. If so, the data processor proceeds to step 540; if not, the data processor proceeds to step 524. CRC is cyclic redundancy checking, a technique known in the art used to detect errors in transmission of data by the affirmation of error codes by both the sending and receiving devices. In one embodiment, a check sum is used in place of a CRC.

At step 540, a determination is made as to whether the device 12 was killed by a previous command. If so, the data processor proceeds to step 542; if not, the data processor proceeds to step 544.

At step 542, a determination is made as to whether the received command is a WriteTagRegs command which can reset the kill bits in the control register. If so, the data processor proceeds to step 544; if not, the data processor proceeds to step 548, which is identical to step 524 on the previous page of the diagram.

At step 544, a determination is made as to whether a valid command token exists for the received command. If so, the data processor proceeds to step 546; if not, the data processor proceeds to step 548.

At step 546, a determination is made as to whether variables TagID and InterrID transmitted to the device 12 correctly correspond to the identification number for the particular device 12 and the identification number for the interrogator with which the particular device 12 is to correspond. If so, the data processor proceeds to step 550; if not, the data processor proceeds to step 548.

At step 548, the command processing routine is aborted, and the device 12 returns to the sleep mode.

At step 550, the data processor jumps to code for the specific command that was received by radio frequency. If the command is an Identify command, the data processor will jump to step 552, which is the start of an Identify command routine.

Figure 57B:
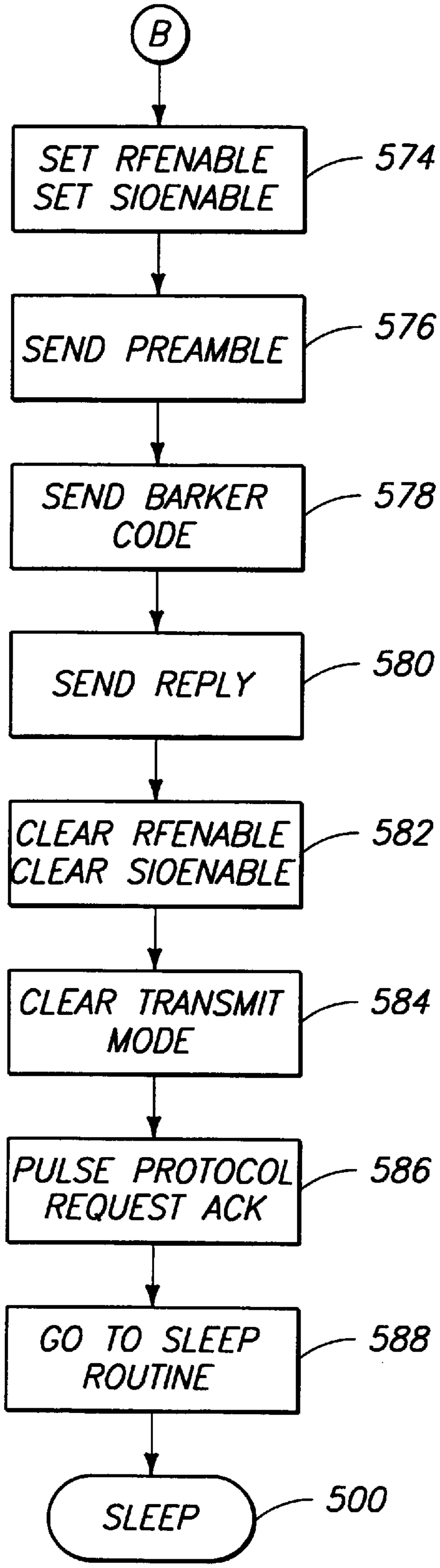

The Identify command routine is illustrated in FIGS. 57A–B.

At step 554, a determination is made as to whether a timed lockout has been set by a previously received command. If so, the data processor proceeds to step 556; if not, the data processor proceeds to step 558.

At step 556, the Identify command routine is aborted, and the device 12 returns to the sleep mode.

At step 558, a determination is made as to whether a variable "InterrID" transmitted to the device 12 correctly corresponds to the identification number for the interrogator with which the particular device 12 is to correspond. If so, the data processor proceeds to step 560; if not, the data processor proceeds to step 556.

At step 560, Arbitration Lockout is cleared if this is requested. After performing step 560, the data processor proceeds to step 562.

At step 562, a new random number is obtained if this is requested. After performing step 562, the data processor proceeds to step 564.

At step 564, arbitration parameters are checked. After performing step 564, the data processor proceeds to step 566.

At step 566, a determination is made as to whether the particular device 12 should respond. If so, the data processor proceeds to step 568; if not, the data processor proceeds to step 556.

At step 568, reply parameters are assembled and stored in the RAM. After performing step 568, the data processor proceeds to step 570.

At step 570, a battery status bit is updated to indicate whether the battery voltage is below a threshold value. This information is included in the reply to the Identify command that is sent to the interrogator. After performing step 570, the data processor proceeds to step 572.

At step 572, CRC is calculated. After performing step 572, the data processor proceeds to step 574.

At step 574, high signals are set on lines RFENABLE and SIOENABLE to enable radio frequency transmission and to enable the serial input output block which transfers the data to be transmitted (i.e., the reply parameters) from the processor to the transmit circuitry. After performing step 574, the data processor proceeds to step 576.

At step 576, the device 12 sends a preamble, consisting of 2000 bits of alternating pairs of ones and zeros, to the interrogator via radio frequency. After performing step 576, the data processor proceeds to step 578.

At step 578, the device 12 sends the 13 bit start code to the interrogator via radio frequency. After performing step 578, the data processor proceeds to step 580.

At step 580, the data processor sends a reply to the Identify command to the interrogator via radio frequency. After performing step 580, the data processor proceeds to step 582.

At step 582, the high signals on lines RFENABLE and SIOENABLE are cleared. After performing step 582, the data processor proceeds to step 584.

At step 584, transmit mode is cleared. After performing step 584, the data processor proceeds to step 586.

At step 586, the processor pulses the Protocol Request Acknowledge signal which terminates the wakeup condition that initiated this entire routine. After performing step 586, the data processor proceeds to step 588.

At step 588, the data processor returns certain control register bits to their proper states in preparation for sleep mode. The processor then proceeds to step 500 and returns to sleep mode.

The sequence of steps performed by an interrogator to issue an Identify command will now be provided, reference being made to FIGS. 58–60.

FIG. 58 illustrates steps performed by a host processor of the interrogator upon initialization. Initialization is started in step 600 by calling a function.

At step 602, a determination is made as to whether an attempt is being made to open more than a maximum number of interrogators. If so, the host processor proceeds to step 604; if not, the host processor proceeds to step 606.

At step 604, an appropriate error message is returned by setting the parameter RFID ErrorNum to the appropriate value, and a null value is returned to the calling function.

At step 606, interrogator parameters are initialized. This includes initializing timeout values, interrogator types and ports. After performing step 606, the host processor proceeds to step 608.

At step 608, a determination is made as to whether a valid interrogator IO port has been selected. If so, the host processor proceeds to step 612; if not, the host processor proceeds to step 610.

At step 610, an appropriate error message is returned. The parameter RFID ErrorNum is set to the appropriate value and a null is returned to the calling function.

At step 612, function addresses are assigned. This includes the function to compute CRCs or checksums and the input and output routines. After performing step 612, the host processor proceeds to step 614.

At step 614, default communication values are assigned. This includes default selections for diversity and communication retries. After performing step 614, the host processor proceeds to step 616.

At step 616, communication hardware is reset. This initializes the interrogator into a known state by resetting the hardware and clearing the I/O FIFO's. After performing step 616, the host processor proceeds to step 618.

At step 618, a frequency synthesizer is initialized. This function programs the frequency synthesizer to the desired frequency. After performing step 618, the host processor proceeds to step 620.

At step 620, a determination is made as to whether the frequency synthesizer is programmed properly. This function is used to abort the initialization process if the frequency synthesizer cannot be programmed, thereby preventing subsequent communications to occur on inappropriate frequencies. If so, the host processor proceeds to step 622; if not, the host processor proceeds to step 624.

At step 622, an host memory pointer is returned that points to a structure that contains the initialized parameters. After performing step 622, program control is returned to the Host Application Code.

At step 624, an appropriate error message is returned in the RFID ErrorNum parameter and a null is returned to the calling function.

FIG. 59 illustrates an example of a software application, starting at step 630, that calls the Identify function and causes the interrogator to transmit an Identify command via radio frequency.

At step 632, the function shown and described above in connection with FIG. 58 is called. After a successful call to the open functions (step 632) the host computer proceeds to step 634.

At step 634, a determination is made as to whether the function shown and described in connection with FIG. 58 was successfully opened. If so, the system proceeds to step 638; if not, the system proceeds to step 636.

At step 636, the host processor exits the application (or takes whatever steps are appropriate within the intended application).

At step 637, the parameters are initialized for an Identify Command.

At step 638, an Identify function (described below in connection with FIG. 60) is called. After performing step 638, the host library function proceeds to step 640.

At step 640, a determination is made as to whether a good reply was received from the device 12. If so, the host computer proceeds to step 642; if not, the host processor proceeds to step 644.

At step 642, reply parameters received from the device 12 are printed, displayed, or otherwise used or processed. After performing step 642, the host computer proceeds to step 646 where the application returns results and ends.

At step 644, the host processor exits the application or takes whatever steps are appropriate for a given application.

FIG. 60 illustrates the sequence of steps performed by the host library function at the starting at step 650, when an Identify command is issued to the device 12.

At step 654, the command buffer is packetized, using the host application initialized parameters. After performing step 654, the host computer proceeds to step 656.

At step 656, the packet CRC is computed and stored at the end of the packet.

At step 658, the packet including the CRC is stored in an interrogator transmit queue that operates in a first in, first out fashion. After performing step 658, the host computer proceeds to step 659.

At step 659, the interrogator is commanded to output the packet to the RF.

At step 660, a watchdog timer is set. After performing step 660, the host computer proceeds to step 662.

At step 662, a determination is made as to whether a reply is available from the device 12. If so, the host computer proceeds to step 668; if not, the host computer proceeds to step 664.

At step 664, a determination is made as to whether the watchdog timer set in step 660 has expired. If so, the host computer proceeds to step 666; if not, the host computer proceeds to step 662.

At step 666, the host computer returns no reply and terminates processing for the Identify command.

At step 668, CRC is checked to ensure error free transmission from the device 12 to the interrogator. After performing step 668, the host computer proceeds to step 670.

At step 670, the reply packet is read from the reply FIFO. After performing step 670, the library routine proceeds to step 672.

At step 672, the reply packet is parsed into separate parameter buffers. After performing step 672, the host library returns program control to the host application (step 674), where processing for the Identify command terminates and the host application software continues.

Details of Arbitration

The arbitration of multiple interrogators per device 12 is a detection method based upon each interrogator using a unique interrogator ID (InterrId). The InterrId is sent to a device 12 in a command. The device 12 also stores an interrogator ID TagStoredInterrId. The TagStoredInterrId is only updated by a WriteTagRegsXXX command. A RcvdInterrId is included in replies from a device 12. If a TagStoredInterrId does not match the RcvdInterrId then the tag will not respond with a reply.

The arbitration of more than one tag per interrogator 26 is accomplished by using an ArbitrationValue and an ArbitrationMask during an Identify command. Contained within each device 12 is a random value ID (RandomValueId) and an arbitration lockout (IDENTIFY_LOCKOUT) bit. The RandomValueId is set to a "random" binary number upon command by an interrogator. It may also be set by an Identify command setting a SELECT_RANDOM_VALUE bit in SubCmnd.

The following examples use a 1-byte ArbitrationValue for simplicity. If an interrogator 26 transmits an Identify command with its ArbitrationMask set to 0000 0000 (binary), all devices 12 in the receiving range will respond. If there is only one device 12, communications may proceed between the interrogator 26 and device 12. If there are multiple devices 12 responding, the interrogator 26 will detect a collision and will start the arbitration sequence. To start the arbitration sequence among multiple tags, the interrogator 26 instructs the tags to clear their IDENTIFY_LOCKOUT bit and (possibly) re-randomize their RandomValueId values. The ArbitrationValue 0000 0000 and ArbitrationMask 0000 0001 are then transmitted to all devices 12 in range. The devices 12 perform a logical ANDing (masking) of the ArbitrationMask and the RandomValueId. If the result matches the ArbitrationValue sent by the interrogator 26, the device or devices 12 will reply to the Identify command. If not, the interrogator 26 will increment the ArbitrationValue to 0000 0001 and try again.

The interrogator 26 then checks each of the possible binary numbers (0000 0000 and 0000 0001 in this case) in the expanded mask (0000 0001) for a response by a device 12. If a single device 12 responds to one of these values, the interrogator 26 will reply by commanding it to set its lockout bit. If any collisions are detected at this mask level, the mask would be widened again by one bit, and so on through the eight bit wide mask (256 numbers). If no collisions are detected for a particular ArbitrationValue and ArbitrationMask combination, the TagId returned in the reply is used for direct communication with that particular device 12. During the arbitration sequence with up to about one hundred devices 12, the mask will eventually grow large enough such that all devices 12 can respond without collision. After the mask widens to four or five bits, more devices 12 have unique random numbers and single tag replies are received. Thus with each expansion of the ArbitrationMask, there are fewer and fewer tags left to Identify.

With a large number of tags in range, it is possible that several devices 12 will choose the same value for their RandomValueId. In this case, the complete mask will be used. Collisions will still occur and the remaining tags will be instructed to select a new Random ValueId. If an application dictates, for example, that one hundred tags will usually be present in range of the interrogator 26, it would be advantageous to start with the mask set to eight bit wide (11111111) and count up through 256 instead of starting with the mask set at 0000 0000, followed by 0000 0001, 0000 0011, etc. Other arbitration schemes can be implemented by the user.

Applications

There are a large number of possible applications for devices such as the device 12. Because the device 12 includes an active transponder, instead of a transponder which relies on magnetic coupling for power, the device 12 has a much greater range.

One application for devices 12 is inventory control to determine the presence of particular items within a large lot of products.

Another application for devices 12 is electronic article surveillance (EAS). The devices 12 can be attached to retail items in a store [ h]aving an interrogator 26 at the exits, for detection of unauthorized removal of retail items. The merchant can deactivate or remove devices 12 from retail items for which proper payment has been made.

Another application for devices 12 is to track migration of animals.

Another application for devices 12 is to counteract terrorism by monitoring luggage entering a plane to ensure that each item of luggage that enters the plane is owned by a passenger who actually boards the plane. The devices 12 can also be used to monitor luggage to locate lost luggage.

The device 12 can be use to track packages, such as courier packages.

The device 12 can be used to track hazardous chemicals or waste to ensure that it safely reaches a proper disposal site.

The device 12 can be used for security purposes, to track personnel within a building. The device 12 can also be used for access control.

The device 12 can be used to monitor and manage freight transit. For example, interrogators 26 can be placed at the entrance and exit of a terminal (e.g., a rail or truck terminal), to monitor incoming and outgoing shipments of vehicles bearing the devices 12.

The device 12 can be used to impede car theft. A European anti-theft directive (74/61/EEC) provides that all new car models sold after January 1997 must be fitted with electronic immobilizers and approved alarm systems. The devices 12 can be provided on keychains or within car keys, and interrogators 26 placed in cars, so that the vehicle will be inoperable unless the specified device 12 for a specific car is used. The interrogator 26 can control the door locks of a car, or the ignition of the car, or both. Because the device 12 includes memory, the interrogator 26 in the car can periodically automatically change values in the device 12 (like changing a password).

Devices 12 can be placed in cars and used in connection with electronic toll collections systems. Because the devices 12 can be used to identify the respective cars in which they are placed, interrogators 26 in toll plazas can charge appropriate accounts based on which cars have passed the toll plaza.

Devices 12 can be placed in cars and used in connection with parking systems. Because the devices 12 can be used to identify the respective cars in which they are placed, interrogators 26 in parking areas can determine when a vehicle arrives and leaves a parking area.

The devices 12 can be used for inventory control of rental equipment.

The devices 12 can be used where bar code labels will not properly work because of harsh environmental conditions (e.g., grease, dirt, paint).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A stage for a voltage controlled oscillator, the stage comprising:

a first p-channel transistor having a gate defining a control node, having a source adapted to be coupled to a supply voltage, and having a drain;

a second p-channel transistor having a gate coupled to the control node, having a source coupled to the supply voltage, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current draw coupled to the sources of the first and second n-channel transistors and configured to direct current away from the sources of the first and second n-channel transistors;

a first load coupled between the supply voltage and the drain of the first n-channel transistor;

a second load coupled between the supply voltage and drain of the second n-channel transistor;

a first source follower having an input coupled to the first node and having an output defining a first output of the stage; and a second source follower having an input coupled to the second node and having an output defining a second output of the stage.

2. A transmitter including a ring oscillator having a chain of stages, each stage comprising:

a first p-channel transistor having a gate defining a control node, having a source adapted to be coupled to a supply voltage, and having a drain;

a second p-channel transistor having a gate coupled to the control node, having a source coupled to the supply voltage, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current draw coupled to the sources of the first and second n-channel transistors directing current away from the sources of the first and second n-channel transistors;

a first load coupled between the supply voltage and the drain of the first n-channel transistor;

a second load coupled between the supply voltage and drain of the second n-channel transistor;

a first source follower having an input coupled to the first node and having an output defining a first output of the stage; and a second source follower having an input coupled to the second node and having an output defining a second output of the stage.

3. A stage for a voltage controlled oscillator, the stage comprising:

a first p-channel transistor having a gate, having a source, and having a drain;

a second p-channel transistor having a gate coupled to the gate of the first p-channel transistor, having a source coupled to the supply voltage, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current source coupled to the sources of the first and second n-channel transistors and configured to direct current from the sources of the first and second n-channel transistors;

a first load coupled between the source of the first p-channel transistor and the drain of the first n-channel transistor;

a second load configured to be coupled between a supply voltage and the drain of the second n-channel transistor;

a first source follower having an input coupled to the first node and having an output defining a first output of the stage; and a second source follower having an input coupled to the second node and having an output defining a second output of the stage.

4. A stage for a voltage controlled oscillator in accordance with claim 3 wherein the first source follower comprises a transistor having a gate coupled to the first node, a drain, and a source; and the source follower further comprises a current source configured to direct current from the source of the transistor of the source follower.

5. A stage for a voltage controlled oscillator in accordance with claim 3 wherein the second source follower comprises a transistor having a gate coupled to the second node, a drain, and a source; and the source follower further comprises a current source configured to direct current from the source of the transistor of the second source follower.

6. A transmitter including a ring oscillator having a plurality of chained stages, at least one of the stages comprising:

a first p-channel transistor having a gate, having a source adapted to be coupled to a supply voltage, and having a drain;

a second p-channel transistor having a gate coupled to the gate of the first p-channel transistor, having a source coupled to the supply voltage, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current source coupled to the sources of the first and second n-channel transistors and configured to direct current from the sources of the first and second n-channel transistors;

a first load coupled between the source of the first p-channel transistor and the drain of the first n-channel transistor;

a second load coupled between the supply voltage and drain of the second n-channel transistor;

a first source follower having an input coupled to the first node and having an output defining a first output of the stage; and a second source follower having an input coupled to the second node and having an output defining a second output of the stage.

7. A transmitter in accordance with claim 6 wherein the first source follower comprises a transistor having a gate coupled to the first node, a drain, and a source; and the source follower further comprises a current source configured to direct current from the source of the transistor of the source follower.

8. A transmitter in accordance with claim 7 wherein the second source follower comprises a transistor having a gate coupled to the second node, a drain, and a source; and the source follower further comprises a current source configured to direct current from the source of the transistor of the second source follower.

9. A stage for a voltage controlled oscillator, the stage comprising:

a first p-channel transistor having a gate defining a control node, having a source, and having a drain;

a second p-channel transistor having a gate coupled to the control node, having a source coupled to the source of the first p-channel transistor, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current source coupled to the sources of the first and second n-channel transistors and configured to direct current from the sources of the first and second n-channel transistors;

a first load coupled between the source of the first p-channel transistor, and the drain of the first n-channel transistor;

a second load coupled between the source of the first p-channel transistor, and drain of the second n-channel transistor;

a first output coupled to the first node; and a second output coupled to the second node.

10. A stage for a voltage controlled oscillator in accordance with claim 9 and further comprising a first source follower defining the first output, the first source follower including a transistor having a gate coupled to the first node, a drain, and a source; and the first source follower further including a current source configured to direct current from the source of the transistor of the source follower.

11. A stage for a voltage controlled oscillator in accordance with claim 10 and further comprising a second source follower defining the second output, the second source follower including a transistor having a gate coupled to the second node, a drain, and a source; and the second source follower further including a current source configured to direct current from the source of the transistor of the second source follower.

12. A transmitter including a ring oscillator having a plurality of chained stages, at least one of the stages comprising:

a first p-channel transistor having a gate defining a control node, having a source, and having a drain;

a second p-channel transistor having a gate coupled to the control node, having a source coupled to the source of the first p-channel transistor, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current source coupled to the sources of the first and second n-channel transistors to direct current from the sources of the first and second n-channel transistors;

a first load coupled between the source of the first p-channel transistor, and the drain of the first n-channel transistor;

a second load coupled between the source of the first p-channel transistor, and drain of the second n-channel transistor;

a first output coupled to the first node; and a second output coupled to the second node.

13. A transmitter in accordance with claim 12 and further comprising a first source follower defining the first output, the first source follower including a transistor having a gate coupled to the first node, a drain, and a source; and the first source follower further including a current source configured to direct current from the source of the transistor of the source follower.

14. A transmitter in accordance with claim 12 and further comprising a second source follower defining the second output, the second source follower including a transistor having a gate coupled to the second node, a drain, and a source; and the second source follower further including a current source configured to direct current from the source of the transistor of the second source follower.

15. A voltage controlled oscillator including a plurality of stages, at least one of the stages comprising:

a first p-channel transistor having a gate defining a control node, having a source, and having a drain;

a second p-channel transistor having a gate coupled to the control node, having a source coupled to the source of the first p-channel transistor, and having a drain;

a first n-channel transistor having a gate defining a first input, having a drain coupled to the drain of the first p-channel transistor and defining a first node, and having a source;

a second n-channel transistor having a gate defining a second input, having a drain coupled to the drain of the second p-channel transistor and defining a second node, and having a source;

a current source coupled to the sources of the first and second n-channel transistors and configured to direct current from the sources of the first and second n-channel transistors;

a first load configured to be coupled between a supply voltage and the drain of the first n-channel transistor;

a second load coupled between the supply voltage and drain of the second n-channel transistor;

a first source follower having an input coupled to the first node and having an output defining a first output of the stage; and a second source follower having an input coupled to the second node and having an output defining a second output of the stage.

16. A voltage controlled oscillator in accordance with claim 15 wherein the first source follower comprises a transistor having a gate coupled to the first node, a drain coupled to the supply voltage, and a source; and the source follower further comprises a current source configured to direct current from the source of the transistor of the source follower.

17. A voltage controlled oscillator in accordance with claim 15 wherein the second source follower comprises a transistor having a gate coupled to the second node, a drain coupled to the supply voltage, and a source; and the source follower further comprises a current source configured to direct current from the source of the transistor of the second source follower.

* * * * *

UNITED STATES PATENT AND TRADEMARK OFFICE

CERTIFICATE OF CORRECTION

PATENT NO. : 6,351,190 B1
DATED : February 26, 2002
INVENTOR(S) : James E. O'Toole et al.

It is certified that error appears in the above-identified patent and that said Letters Patent is hereby corrected as shown below:

Column 2,
Lines 35 and 36, FIG. 5,
replace "semiconductor integrated circuit utilized in the devices of FIGS. 14."
with -- semiconductor integrated circuit utilized in the devices of FIGS. 1-4. --

Column 3,
Line 57, replace "column select decode r8 circuit "ramcdec" included in the"
with -- column select decode circuit "ramcdec" included in the --
Line 60, replace "70309AA-BG are to be assembled. After such assembly,"
with -- 7.0309AA-BG are to be assembled. After such assembly, --

Column 9,
Line 32, replace "up abort logic counter bit "wuabort cbit" included in the"
with -- up abort logic counter bit "wuabort_cbit" included in the --

Column 13,
Line 27, replace "FIG. 9.03Q1 is a graph illustrating how FIGS." with -- FIG. 9.0301 is a graph illustrating how FIGS. --

Column 14,
Line 43, replace "FIGS. 10.001AA-BG provide a circuit drawing of a PN"
with -- FIGS. 10.0101AA-BG provide a circuit drawing of a PN --
Line 47, replace ""dcorr_bit" included in the circuit of FIGS. 10.001AA-BG"
with -- "dcorr_bit" included in the circuit of FIGS. 10.0101AA-BG --

Column 15,
Line 24, replace "FIGS. 10.06AA-DH provide a as circuit drawings of" with -- FIGS. 10.06AA-DH provide a circuit drawings of --

Column 16,
Line 21, replace "provide a circuit drawing of a data processor "dataproct3" to"
with -- provide a circuit drawing of a data processor "dataproc_t3" to --
Line 31, replace "ROM control logic "nextromctl" included in the circuit of"
with -- ROM control logic "extromctl" included in the circuit of --

Column 28,
Line 29, replace "having iv smaller values that the first mentioned" with -- having smaller values than the first mentioned --
Line 54, replace "resistances respectively having smaller values that the first"
with -- resistances respectively having smaller values than the first --

UNITED STATES PATENT AND TRADEMARK OFFICE

CERTIFICATE OF CORRECTION

PATENT NO. : 6,351,190 B1
DATED : February 26, 2002
INVENTOR(S) : James E. O'Toole et al.

It is certified that error appears in the above-identified patent and that said Letters Patent is hereby corrected as shown below:

Column 35,
Lines 63 and 64, replace "inseparably associated on or within a continuous [su]b-strate." with -- inseparably associated on or within a continuous sub-strate. --

Column 38,
Line 14, replace "Communications System now abandoned" and continuation" with -- Communications System" now abandoned and continuation --
Lines 16 and 17, replace "Communications System now U.S. Pat. No. 5,790,946";" with -- Communications System" now U.S. Pat. No. 5,790,946; --
Lines 18 and 19, replace "Transmitter Frequency Control now U.S. Pat. No. 5,568,512";" with -- Transmitter Frequency Control" now U.S. Pat. No. 5,568,512; --

Column 39,
Line 10, replace "'sleep" mode of operation, and higher power modes to" with -- "sleep" mode of operation, and higher power modes to --

Column 42,
Line 32, replace "described in a paper titled Designing Detectors for RFIID" with -- described in a paper titled Designing Detectors for RF/ID --
Line 66, replace "received via radio frequency from the a interrogator 26. The" with -- received via radio frequency from the interrogator 26. The --

Column 43,
Line 64, replace "wake Up timer and logic compares the incoming signal to" with -- wake up timer and logic compares the incoming signal to --

Column 44,
Line 19, replace "command. this is a processor on mode illustrated by a" with -- command. This is a processor on mode illustrated by a --

Column 48,
Line 37, replace "device 12, and the other 256 bites are used to do calculations" with -- device 12, and the other 256 bytes are used to do calculations --
Line 55, replace "In the illustrated embodiment, this dcircuit has" with -- In the illustrated embodiment, this circuit has --

UNITED STATES PATENT AND TRADEMARK OFFICE
CERTIFICATE OF CORRECTION

PATENT NO. : 6,351,190 B1
DATED : February 26, 2002
INVENTOR(S) : James E. O'Toole et al.

It is certified that error appears in the above-identified patent and that said Letters Patent is hereby corrected as shown below:

Column 49,
Line 22, replace "more similar selections taking place SO an entire byte of" with -- more similar selections taking place so an entire byte of --
Line 42, replace "or laser fuse programmable, or [el]ectrical fuse" with -- or laser fuse programmable, or electrical fuse --

Column 50,
Line 30, replace "appropriately to that command Then the program allows the" with -- appropriately to that command. Then the program allows the --

Column 53,
Line 2, replace "lock out register cell "tlorcerl included in the timed lockout" with -- lock out register cell "tlorcel" included in the timed lockout --

Column 54,
Line 40, replace "the contents of the registers "dil_1sreg" are shifted out" with -- the contents of the registers "dil_plsreg" are shifted out --

Column 55,
Line 22, replace "recovery and data recovery a circuit 38, and the wake up" with -- recovery and data recovery circuit 38, and the wake up --
Line 30, replace "counter bit "Ipfll_cbit," a receiver wake up controller" with -- counter bit "lpfll_cbit," a receiver wake up controller --
Line 33, replace "circuit Ndcr" (which is the clock and data recovery circuit 38" with -- circuit "dcr" (which is the clock and data recovery circuit 38 --
Line 34, replace "Thus, RF processor "rfproc" se includes" with -- Thus, RF processor "rfproc" includes --

Column 56,
Line 2, replace "receiver "rx" includes a bias block ccrxbias" that provides" with -- receiver "rx" includes a bias block "rxbias" that provides --

Column 61,
Line 5, replace "hole Imovement." with -- hole movement. --

Column 62,
Line 61, replace "deposited metal is about 200 A. The metal 266 is annealed" with -- deposited metal is about 200 Å. The metal 266 is annealed --

UNITED STATES PATENT AND TRADEMARK OFFICE

CERTIFICATE OF CORRECTION

PATENT NO. : 6,351,190 B1 
DATED : February 26, 2002
INVENTOR(S) : James E. O'Toole et al.

It is certified that error appears in the above-identified patent and that said Letters Patent is hereby corrected as shown below:

Column 63,
Line 49, replace "Details of Ouick Bias AC-Coupled Video Amplifier"
with -- Details of Quick Bias AC-Coupled Video Amplifier --

Column 64,
Line 22, replace "approximately 1((2 MegaOhms)(1 pF))=500 kiloradians/"
with -- approximately 1/((2 MegaOhms)(1pF))=500 kiloradians/ --

Column 67,
Lines 17 and 18, replace "construction details of a timed lockout divider cell "tldcel bypass"" with -- construction details of a timed lockout divider cell "tldcel_bypass" --

Column 68,
Line 1, replace "approximately equal to (kT/qR) In ((W/L)Q1/(WIL)Q2)."
with -- approximately equal to (kT/qR) In ((W/L)Q1/(W/L)Q2). --
Line 18, replace "select 1 "Sel1," select 2 "Sel2," select 4, and select"
with -- select 1 "Sel1," select 2 "Sel2," select 4, and select 8 --
Line 61, replace "FIGS. 8.0204AA-EJ as going down the right side of page,"
with -- FIGS. 8.0204AA-EJ as going down the right side of the page, --

Column 69,
Lines 29 and 30, replace "Another other suitable values can be employed"
with -- Other suitable values can be employed --
Line 66, replace "construction details of a counter bit "lpfllcbit" included in"
with -- construction details of a counter bit "lpfll_cbit" included in --

Column 73,
Line 48, replace "as To in FIG. 54), a signal "SDD" (start data decoding) is"
with -- as $T_o$ in FIG. 54), a signal "SDD" (start data decoding) is --

Column 74,
Line 7, replace "values [th]at are turned on for a fixed period of time to"
with -- values that are turned on for a fixed period of time to --
Line 35, replace "then issues wappropriate pump up or pump"
with -- then issues appropriate pump up or pump --

UNITED STATES PATENT AND TRADEMARK OFFICE
CERTIFICATE OF CORRECTION

PATENT NO. : 6,351,190 B1 
DATED : February 26, 2002
INVENTOR(S) : James E. O'Toole et al.

It is certified that error appears in the above-identified patent and that said Letters Patent is hereby corrected as shown below:

Column 77,
Line 60, replace "frequency is between 75% and 100% of the final value. Puf2"
with -- frequency is between 75% and 100% of the final value. Puf1 --

Column 78,
Line 51, replace "diagram. Assume that Q1 and Q1 are the binary state"
with -- diagram. Assume that Q1 and Q0 are the binary state --
Line 67, replace "D0=[Q1'·(TX·Q0)'·En·TX']'"
with -- D0=[Q1'·(TX·Q0)'·(En·TX']' --

Column 79,
Line 7, replace "D1=TX'·Q1·Q0'+En·TX'Q0'"
with -- D1=TX'·Q1·Q0'+En·TX'·Q0' --
Line 10, replace "D1=[(TX'·Q1'·Q0')'·(En·TX'Q0')']'"
with -- D1=[(TX'·Q1'·Q0')'·(En·TX'·Q0')']' --

Column 80,
Line 31, replace "and an second group of ten capacitors, defining a total"
with -- and a second group of ten capacitors, defining a total --

Column 82,
Line 1, replace "is pumped up to adjust frequency. as The control voltage"
with -- is pumped up to adjust frequency. The control voltage --

Column 83,
Line 14, replace "in such a way that before "CLkOut" can go high"
with -- in such a way that before "CIkOut" can go high --

Column 84,
Line 19, replace "generates eight phases which are 450 out of phase with"
with -- generates eight phases which are 45° out of phase with --

Column 85,
Line 22, replace "output signals having substantially 450 differences in phase"
with -- output signals having substantially 45° differences in phase --
Line 62, replace "between the voltage "V+" and the drain of the transistor 107,"
with -- between the voltage "V+" and the drain of the transistor 107, --
Line 63, replace "and a resistor 111 connected between the voltage "V+" and"
with -- and a resistor 111 connected between the voltage "V+" and --

CERTIFICATE OF CORRECTION

PATENT NO. : 6,351,190 B1
DATED : February 26, 2002
INVENTOR(S) : James E. O'Toole et al.

It is certified that error appears in the above-identified patent and that said Letters Patent is hereby corrected as shown below:

Column 90,
Line 3, replace "signal using a simple s four stage differential oscillator." with -- signal using a simple four stage differential oscillator. --

Column 91,
Lines 51 and 52, replace "sends current to the antenna 44, or is sends none to provide" with -- sends current to the antenna 44, or it sends none to provide --

Column 93,
Line 34, replace "the it integrated circuit 16. This is at the expense of the need" with -- the integrated circuit 16. This is at the expense of the need --
Line 55, replace "an analog to digital (A/D) converter "ada new." The analog" with -- an analog to digital (A/D) converter "ada_new." The analog --

Column 94,
Line 59, replace "performs a number of operation, the last one of which is" with -- performs a number of operations, the last one of which is --

Column 95,
Line 8, replace "A signal from before the fmal inverter producing" with -- A signal from before the final inverter producing --
Line 67, replace "a plurality of r-channel devices connected together in" with -- a plurality of p-channel devices connected together in --

Column 96,
Line 63, replace "oscillator "reg osc" that supplies clock signals to the linear" with -- oscillator "reg_osc" that supplies clock signals to the linear --

Column 97,
Line 19, replace "current current mirror (low power mode), the turn-on" with -- current mirror (low power mode), the turn-on --

Column 99,
Line 67, replace "includes a bias generator "dcor bias" that generates bias" with -- includes a bias generator "dcor_bias" that generates bias --

Column 104,
Line 22, replace "processor "dataproct3" to be used in the integrated circuit of" with -- processor "dataproc_t3" to be used in the integrated circuit of --
Lines 27 and 28, replace "circuit drawing of external ROM" control logic" with -- circuit drawing of external ROM control logic --

UNITED STATES PATENT AND TRADEMARK OFFICE

CERTIFICATE OF CORRECTION

PATENT NO. : 6,351,190 B1
DATED : February 26, 2002
INVENTOR(S) : James E. O'Toole et al.

It is certified that error appears in the above-identified patent and that said Letters Patent is hereby corrected as shown below:

Column 104 cont'd,
Line 43, replace ""PAD L," "PAD M," "PAD N," "PAD 0," "PAD P,""
with -- "PAD L," "PAD M," "PAD N," "PAD O," "PAD P," --

Column 105,
Line 28, replace "line "Dataln."" with -- line "DataIn." --

Column 106,
Line 35, replace "Other pads J, K, L, M, N, 0, and W are voltage supply or"
with -- Other pads J, K, L, M, N, O, and W are voltage supply or --
Line 36, replace "voltage drain pads. (Vss or Vdd)." with -- voltage drain pads (Vss or Vdd). --

Column, 107,
Line 53, replace "LswTagId, TagStoredinterrId, Timed LockOutCounter, and"
with -- LswTagId, TagStoredInterrId, Timed LockOutCounter, and --

Column, 109,
Line 14, replace "and RPENABLE to enable the serial input output block"
with -- and RFENABLE to enable the serial input output block --
Lines 52 and 53, Replace "the receiver is turned off in order to conserve =7 power."
with -- the receiver is turned off in order to conserve power. --

UNITED STATES PATENT AND TRADEMARK OFFICE

CERTIFICATE OF CORRECTION

PATENT NO. : 6,351,190 B1 
DATED : February 26, 2002
INVENTOR(S) : James E. O'Toole et al.

It is certified that error appears in the above-identified patent and that said Letters Patent is hereby corrected as shown below:

Column 112,
Line 3, replace "At step 622, an host memory pointer is returned that" with -- At step 622, a host memory pointer is returned that --

Signed and Sealed this

Twelfth Day of August, 2003

JAMES E. ROGAN
*Director of the United States Patent and Trademark Office*